US012740306B2

(12) United States Patent
Kim et al.

(10) Patent No.: US 12,740,306 B2
(45) Date of Patent: Sep. 15, 2026

(54) HETEROCYCLIC COMPOUND, ORGANIC LIGHT-EMITTING DEVICE INCLUDING THE HETEROCYCLIC COMPOUND, AND ELECTRONIC APPARATUS INCLUDING THE ORGANIC LIGHT-EMITTING DEVICE

(71) Applicant: Samsung Electronics Co., Ltd., Suwon-si (KR)

(72) Inventors: Sangmo Kim, Hwaseong-si (KR); Yongsik Jung, Seoul (KR); Eunsuk Kwon, Suwon-si (KR); Juhyun Kim, Seoul (KR); Yusuke Maruyama, Hwaseong-si (KR); Eunkyung Lee, Seoul (KR); Inkoo Kim, Suwon-si (KR); Sungho Nam, Daegu (KR); Youngmok Son, Suwon-si (KR); Sooghang Ihn, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1218 days.

(21) Appl. No.: 17/573,736

(22) Filed: Jan. 12, 2022

(65) Prior Publication Data

US 2023/0165130 A1 May 25, 2023

(30) Foreign Application Priority Data

Aug. 30, 2021 (KR) ........................ 10-2021-0115027

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
None
See application file for complete search history.

(56) References Cited

U.S. PATENT DOCUMENTS 10,636,979 B2 4/2020 Parham et al.
2003/0218418 A9* 11/2003 Sato .................... H10K 85/342 313/504
2023/0084208 A1 3/2023 Kim et al.

FOREIGN PATENT DOCUMENTS

CN 111574544 A 8/2020
CN 113072571 A 7/2022
(Continued)

OTHER PUBLICATIONS

KR 20200121228 A machine translation (Year: 2020).*
(Continued)

*Primary Examiner* — Elizabeth M. Dahlburg
(74) *Attorney, Agent, or Firm* — CANTOR COLBURN LLP

(57) ABSTRACT

Provided are a heterocyclic compound represented by Formula 1-1 or 1-2, an organic light-emitting device including the heterocyclic compound, and an electronic apparatus including the organic light-emitting device:
(Continued)

Formula 1-1

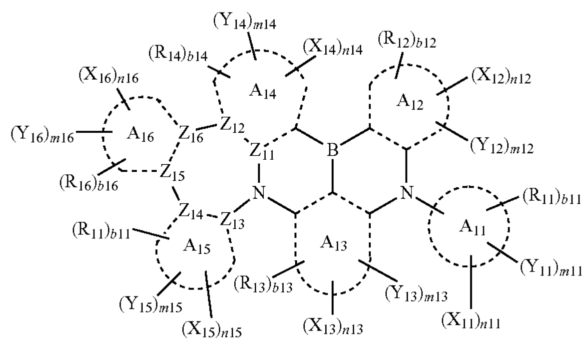

Formula 1-2

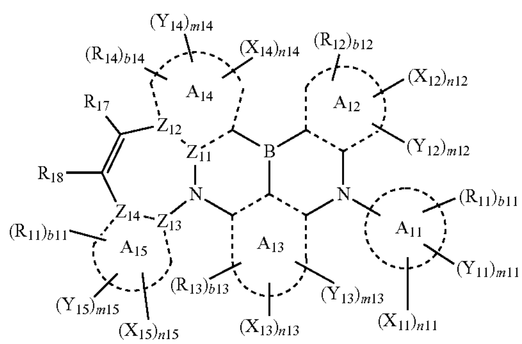

wherein Formulae 1-1 and 1-2 are respectively the same as described in the present specification.

21 Claims, 8 Drawing Sheets

(51) Int. Cl.
*C09K 11/06* (2006.01)
*H10K 50/11* (2023.01)
*H10K 50/12* (2023.01)
*H10K 101/10* (2023.01)

(52) U.S. Cl.
CPC .......... *C09K 2211/10* (2013.01); *H10K 50/11* (2023.02); *H10K 50/121* (2023.02); *H10K 2101/10* (2023.02)

(56) References Cited

FOREIGN PATENT DOCUMENTS

| | | | |
|---|---|---|---|
| KR | 1020170096039 | A | 8/2017 |
| KR | 1020200121228 | A | 10/2020 |
| KR | 20220069866 | A | 5/2022 |

OTHER PUBLICATIONS

Xiao Liang, et al., Peripheral Amplification of Multi-Resonance Induced ThermallyActivated Delayed Fluorescence for Highly Efficient OLEDs, Angew. Chem. Int. Ed. 2018, 57, 11316-11320.
English Abstract of CN 111574544.
English Abstract of CN 113072571.
English Abstract of KR 10-2020-0121228.
Extended European Search Report dated Aug. 12, 2022 issued in EP Patent Application No. 22158252.1, 7 pp.
J. U. Kim, I. S. Park, C.-Y. Chan, M. Tanaka, Y. Tsuchiya, H. Nakanotani, C. Adachi, "Nanosecond-time-scale delayed fluorescencemolecule for deep-blue OLEDs with small efficiency rolloff", Nat. Commun. 2020, 11, 1765, 8 pp.

* cited by examiner

HETEROCYCLIC COMPOUND, ORGANIC LIGHT-EMITTING DEVICE INCLUDING THE HETEROCYCLIC COMPOUND, AND ELECTRONIC APPARATUS INCLUDING THE ORGANIC LIGHT-EMITTING DEVICE

CROSS-REFERENCE TO RELATED APPLICATION

This application claims priority under 35 U.S.C. § 119 to Korean Patent Application No. 10-2021-0115027, filed on Aug. 30, 2021, in the Korean Intellectual Property Office, the content of which is incorporated by reference herein in its entirety.

BACKGROUND

1. Field

The present disclosure relates to heterocyclic compounds, organic light-emitting devices including the heterocyclic compounds, and electronic apparatuses including the organic light-emitting devices.

2. Description of the Related Art

Organic light-emitting devices are self-emissive devices that produce full-color images, and also have wide viewing angles, high contrast ratios, short response times, and excellent characteristics in terms of luminance, driving voltage, and response speed, compared to devices in the art.

In an example, an organic light-emitting device includes an anode, a cathode, and an organic layer arranged between the anode and the cathode and including an emission layer. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state, thereby generating light.

SUMMARY

Provided are heterocyclic compounds, organic light-emitting devices including the heterocyclic compounds, and electronic apparatuses including the organic light-emitting devices.

Additional aspects will be set forth in part in the description, which follows and, in part, will be apparent from the description, or may be learned by practice of the presented embodiments of the disclosure.

According to an aspect of an embodiment, provided is a heterocyclic compound represented by Formula 1-1 or 1-2:

Formula 1-1

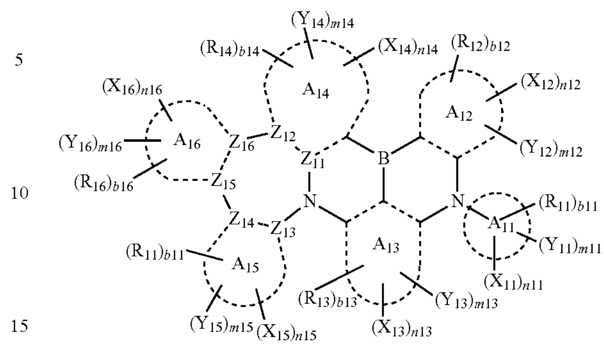

Formula 1-2

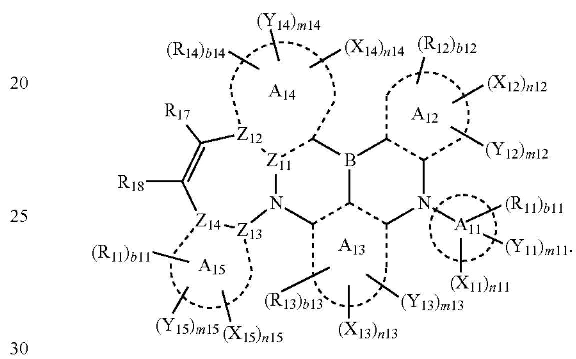

In Formulae 1-1 and 1-2, $A_{11}$ to $A_{16}$ are each independently a substituted or unsubstituted $C_5$-$C_{30}$ carbocyclic group or a substituted or unsubstituted $C_1$-$C_{30}$ heterocyclic group, $X_{11}$ to $X_{16}$ are each independently a group represented by Formula 2-1 or 2-2, n11 to n16 are each independently 0, 1, or 2, the sum of n11 to n16 in Formula 1-1 is 1 or more, and the sum of n11 to n15 in Formula 1-2 is 1 or more, $Y_{11}$ to $Y_{16}$ are each independently a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group, m11 to m16 are each independently 0, 1, or 2, the sum of n11 to n16 and m11 to m16 in Formula 1-1 are each 2 or more, the sum of n11 to n15 and m11 to m15 in Formula 1-2 are each 2 or more, $Z_{11}$ to $Z_{16}$ are each independently a carbon atom, and a bond between $Z_{11}$ and $Z_{12}$, a bond between $Z_{13}$ and $Z_{14}$, and a bond between $Z_{15}$ and $Z_{16}$ are each independently a single bond or a double bond, Formula 2-1

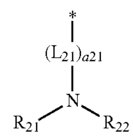

-continued

Formula 2-2

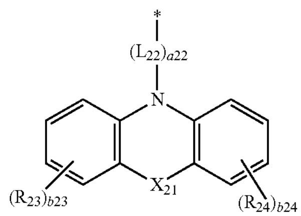

wherein, in Formulae 2-1 and 2-2, $X_{21}$ is a single bond, O, S, $N(R_{25})$, or $C(R_{25})(R_{26})$, $L_{21}$ and $L_{22}$ are each independently a substituted or unsubstituted $C_5$-$C_{30}$ carbocyclic group or a substituted or unsubstituted $C_1$-$C_{30}$ heterocyclic group, a21 and a22 are each independently 0, 1, or 2, $R_{21}$ and $R_{22}$ are each independently a substituted or unsubstituted $C_6$-$C_{60}$ aryl group, $R_{11}$ to $R_{18}$ and $R_{23}$ to $R_{26}$ are each independently hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$C(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, b11 to b16 are each independently 0, 1, 2, or 3, b23 and b24 are each independently 0, 1, 2, 3, or 4, $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof, and

* indicates a binding site to a neighboring atom.

According to an aspect of another embodiment, provided is an organic light-emitting device including: a first electrode; a second electrode; and an organic layer arranged between the first electrode and the second electrode and including an emission layer, wherein the organic layer includes the heterocyclic compound.

According to an aspect of another embodiment, provided is an electronic apparatus including the organic light-emitting device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
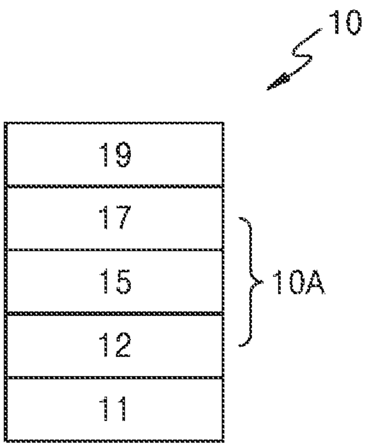
FIG. 1 shows a schematic cross-sectional view of an organic light-emitting device according to an exemplary embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the same associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An aspect of the present disclosure provides a heterocyclic compound represented by Formula 1-1 or 1-2:

Formula 1-1

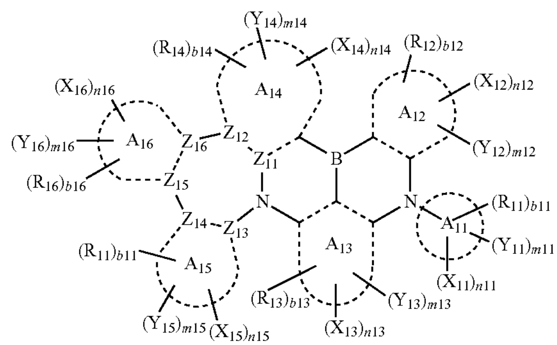

Formula 1-2

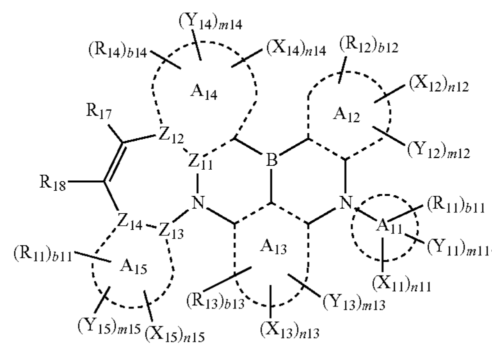

In Formulae 1-1 and 1-2, $A_{11}$ to $A_{16}$ may each independently be a substituted or unsubstituted $C_5$-$C_{30}$ carbocyclic group or a substituted or unsubstituted $C_1$-$C_{30}$ heterocyclic group.

In an embodiment, in Formulae 1-1 and 1-2, $A_{11}$ to $A_{16}$ may each independently be a benzene group, a naphthalene group, a phenanthrene group, a furan group, a thiophene group, a pyrrole group, a cyclopentene group, a silole group, a germole group, a benzofuran group, a benzothiophene group, an indole group, an indene group, a benzosilole group, a benzogermole group, a dibenzofuran group, a dibenzothiophene group, a carbazole group, a fluorene group, a dibenzosilole group, or a dibenzogermole group.

In one or more embodiments, in Formulae 1-1 and 1-2, $A_{11}$ to $A_{16}$ may each independently be a benzene group, a naphthalene group, a benzofuran group, a benzothiophene group, an indole group, an indene group, a benzosilole group, or a benzogermole group.

In one or more embodiments, in Formulae 1-1 and 1-2, $A_{11}$ to $A_{16}$ may each independently be a benzene group or a naphthalene group.

In one or more embodiments, in Formulae 1-1 and 1-2, $A_{11}$ to $A_{16}$ may each independently be a benzene group.

In an embodiment, in Formulae 1-1 and 1-2, $X_{11}$ to $X_{16}$ may each independently be a group represented by Formula 2-1 or 2-2:

Formula 2-1

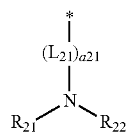

Formula 2-2

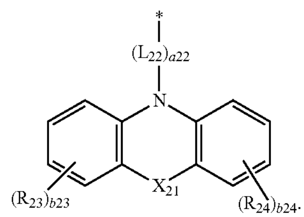

In Formulae 2-1 and 2-2, $X_{21}$ may be a single bond, O, S, $N(R_{25})$, or $C(R_{25})(R_{26})$, $L_{21}$ and $L_{22}$ may each independently be a substituted or unsubstituted $C_5$-$C_{30}$ carbocyclic group or a substituted or unsubstituted $C_1$-$C_{30}$ heterocyclic group, a21 and a22 may each independently be 0, 1, or 2, $R_{21}$ and $R_{22}$ may each independently be a substituted or unsubstituted $C_6$-$C_{60}$ aryl group, $R_{23}$ to $R_{26}$ may each independently be hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$C(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_6$ alkyl group that is substituted with at least one deuterium, —F, a cyano group, a $C_1$-$C_{60}$ alkyl group, and a $C_6$-$C_{60}$ aryl group, and a $C_6$-$C_{60}$ aryl group that is substituted with deuterium, —F, a cyano group, a $C_1$-$C_{60}$ alkyl group, or a $C_6$-$C_{60}$ aryl group, b23 and b24 may each independently be 0, 1, 2, 3, or 4, and

* indicates a binding site to a neighboring atom.

In an embodiment, in Formula 2-2, $X_{21}$ may be a single bond.

In an embodiment, in Formulae 2-1 and 2-2, $L_{21}$ and $L_{22}$ may each independently be a substituted or unsubstituted $C_5$-$C_{30}$ carbocyclic group.

In an embodiment, in Formulae 2-1 and 2-2, a21 and a22 may each independently be 0 or 1.

In an embodiment, in Formula 2-1, $R_{21}$ and $R_{22}$ may each independently be a phenyl group, a biphenyl group, a terphenyl group, a naphthyl group, a phenanthrenyl group, an anthracenyl group, a triphenylenyl group, a pyrenyl group, or a chrysenyl group, each substituted or unsubstituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

In one or more embodiments, in Formula 2-1, $R_{21}$ and $R_{22}$ may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 10-12 to 10-23 and 10-38 to 10-130, a group represented by one of Formulae 10-12 to 10-23 and 10-38 to 10-130 in which at least one hydrogen is substituted with deuterium group, or a group represented by one of Formulae 10-12 to 10-23 and 10-38 to 10-130 in which at least one hydrogen is substituted with —F:

10-12

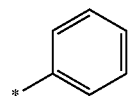

-continued
10-13
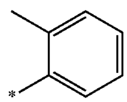
10-14
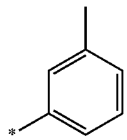
10-15
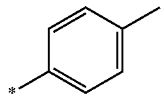
10-16
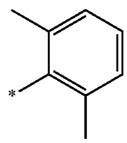
10-17
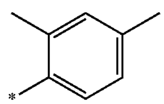
10-18
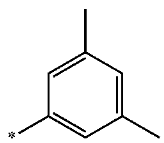
10-19
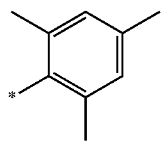
10-20
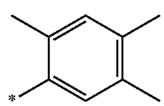
10-21
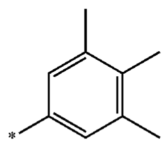
10-22
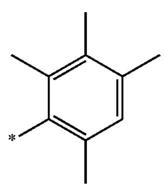
10-23
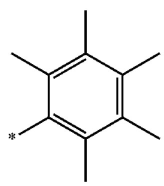
-continued
10-38
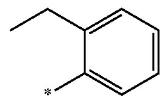
10-39
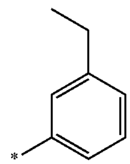
10-40
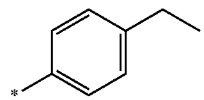
10-41
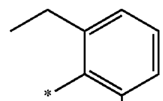
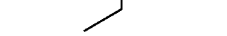
10-42
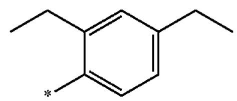
10-43
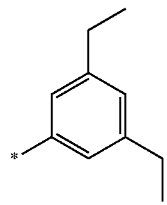
10-44
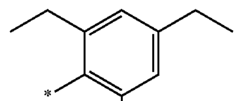
10-45
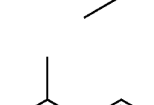
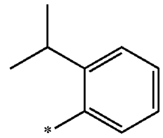
10-46
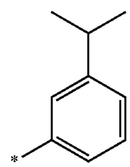
10-47
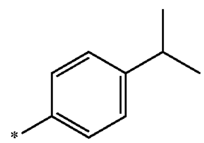

-continued
10-48
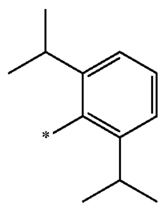
10-49
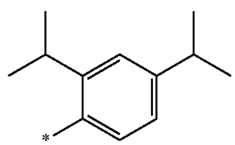
10-50
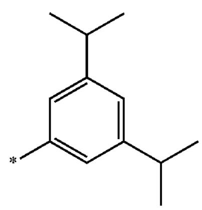
10-51
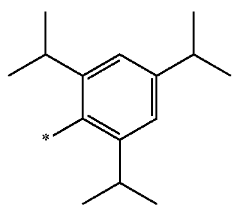
10-52
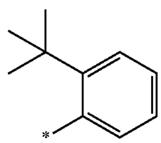
10-53
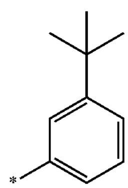
10-54
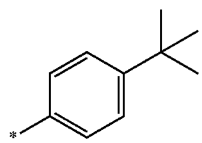
10-55
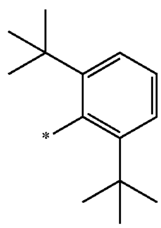
-continued
10-56
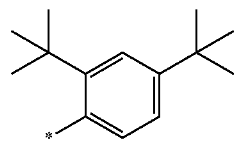
10-57
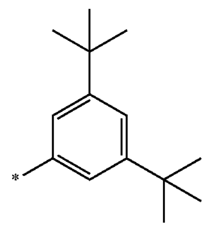
10-58
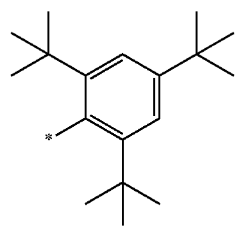
10-59
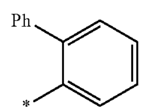
10-60
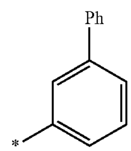
10-61
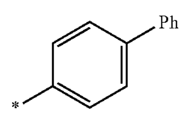
10-62
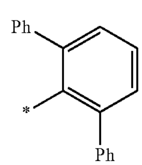
10-63
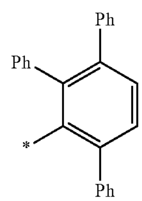
10-64
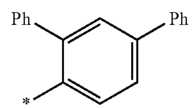

-continued
10-65
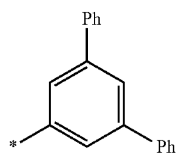
10-66
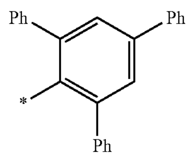
10-67
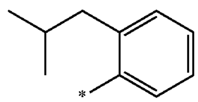
10-68
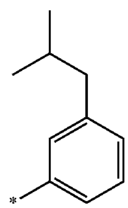
10-69
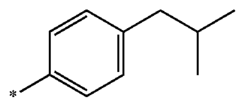
10-70
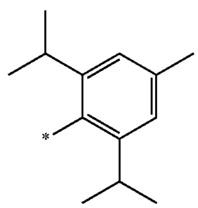
10-71
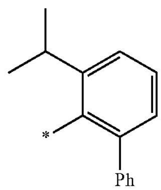
10-72
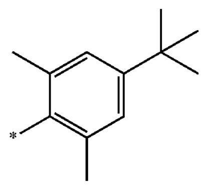
10-73
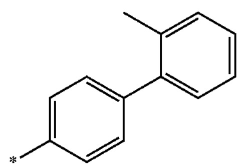
-continued
10-74
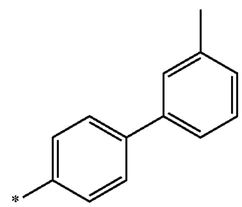
10-75
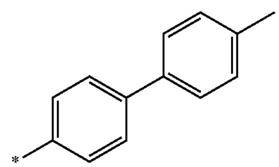
10-76
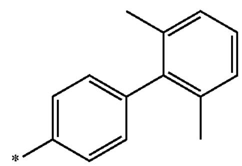
10-77
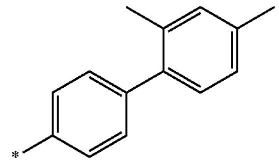
10-78
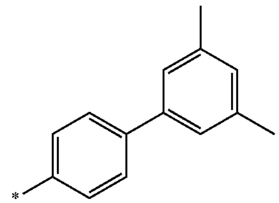
10-79
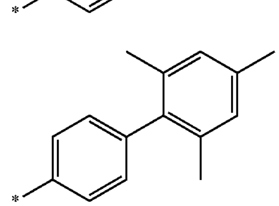
10-80
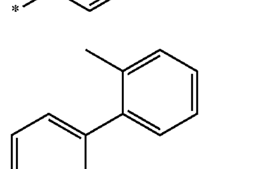
10-81
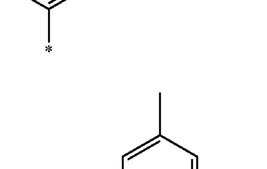
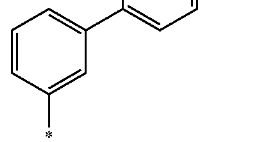

-continued
10-82
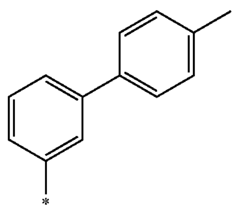
10-83
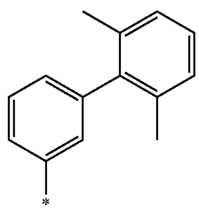
10-84
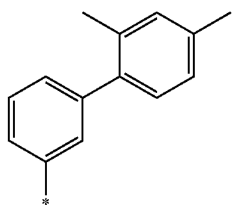
10-85
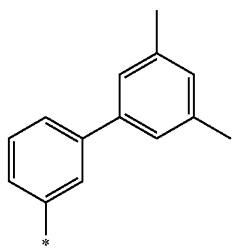
10-86
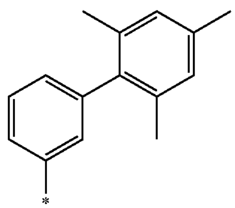
10-87
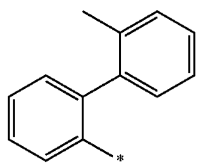
10-88
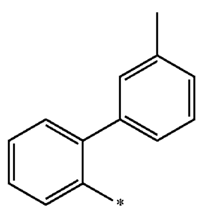
-continued
10-89
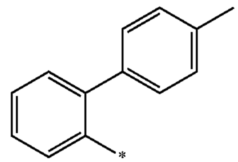
10-90
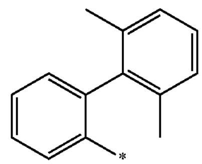
10-91
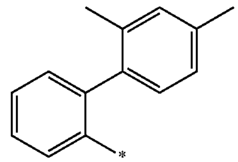
10-92
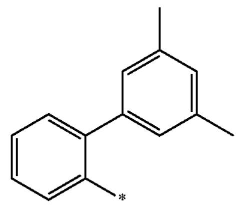
10-93
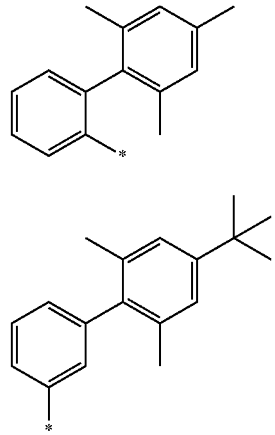
10-94
10-95
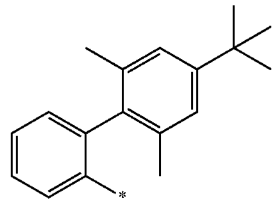
10-96
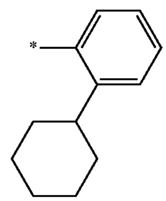

-continued
10-97
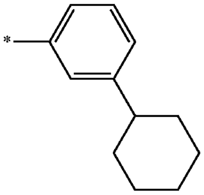
10-98
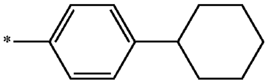
10-99
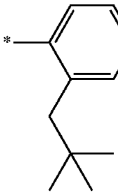
10-100
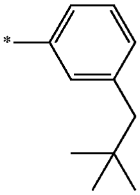
10-101
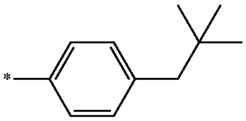
10-102
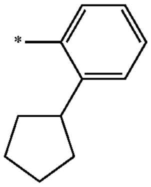
10-103
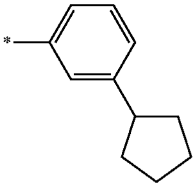
10-104
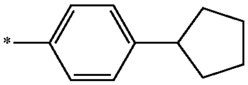
10-105
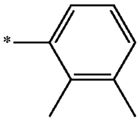
10-106
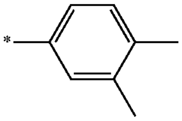
-continued
10-107
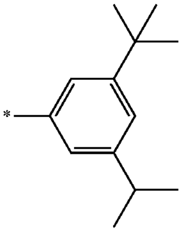
10-108
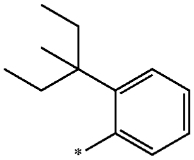
10-109
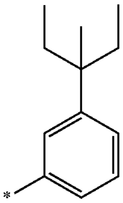
10-110
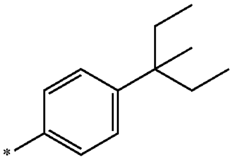
10-111
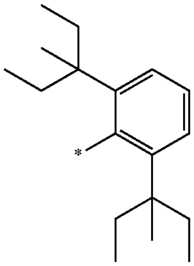
10-112
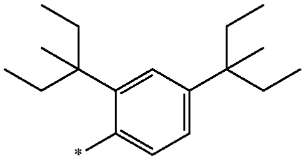
10-113
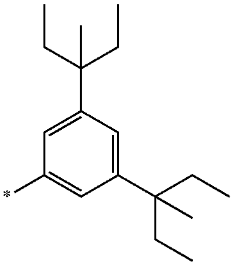

-continued
10-114
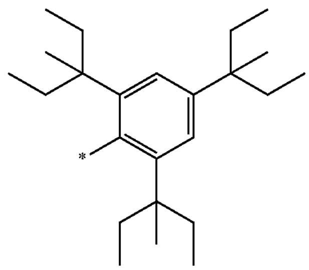
10-115
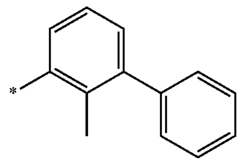
10-116
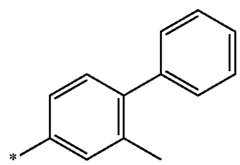
10-117
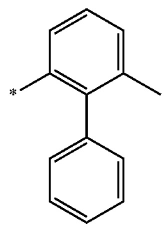
10-118
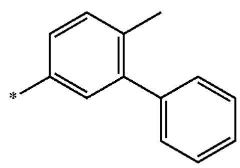
10-119
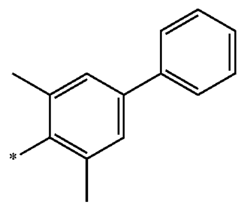
10-120
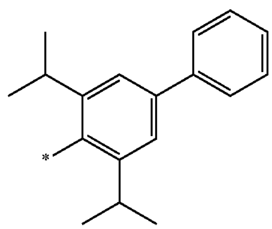
10-121
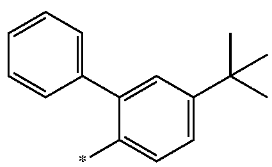
-continued
10-122
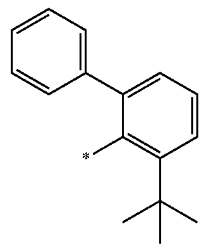
10-123
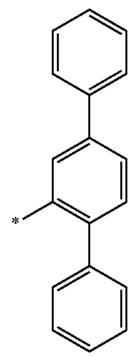
10-124
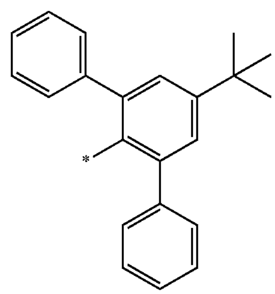
10-125
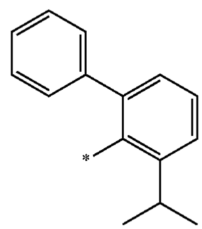
10-126
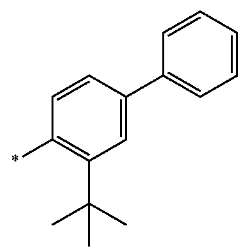
10-127
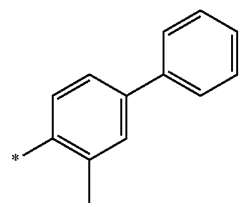

-continued 10-128

10-129

10-130

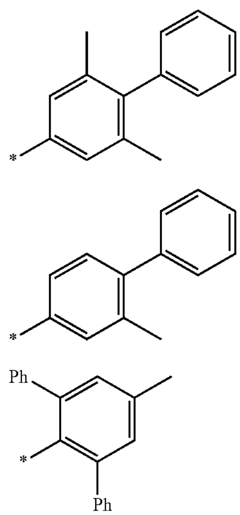

In Formulae 10-12 to 10-23 and 10-38 to 10-130,

"Ph" represents a phenyl group, and

* indicates a binding site to a neighboring atom.

In an embodiment, in Formula 2-2, $R_{23}$ to $R_{26}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a deuterated $C_2$-$C_{20}$ alkyl group, a fluorinated alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —Si($Q_1$)($Q_2$)($Q_3$), —C($Q_1$)($Q_2$)($Q_3$), —B($Q_1$)($Q_2$), or —N($Q_1$)($Q_2$), and $Q_1$ to $Q_3$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof.

In one or more embodiments, in Formula 2-2, $R_{23}$ to $R_{26}$ may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-236, a group represented by one of Formulae 9-201 to 9-236 in which at least one hydrogen is substituted with deuterium, a group represented by one of Formulae 9-201 to 9-236 in which at least one hydrogen is substituted with —F, a group represented by one of Formulae 10-1 to 10-130, a group represented by one of Formulae 10-1 to 10-130 in which at least one hydrogen is substituted with deuterium, a group represented by one of Formulae 10-1 to 10-130 in which at least one hydrogen is substituted with —F, a group represented by one of Formulae 10-201 to 10-358, a group represented by one of Formulae 10-201 to 10-358 in which at least one hydrogen is substituted with deuterium, a group represented by one of Formulae 10-201 to 10-358 in which at least one hydrogen is substituted with —F, —Si($Q_1$)($Q_2$)($Q_3$), or —Ge($Q_1$)($Q_2$)($Q_3$), and $Q_1$ to $Q_3$ may each independently be:

deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, —F, a $C_1$-$C_{10}$ alkyl group, a phenyl group, or any combination thereof:

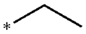
9-1

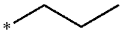
9-2

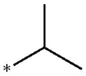
9-3

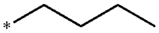
9-4

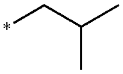
9-5

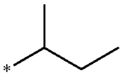
9-6

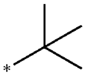
9-7

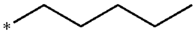
9-8

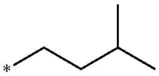
9-9

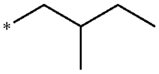
9-10

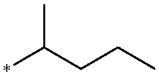
9-11

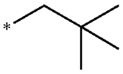
9-12

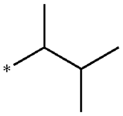
9-13

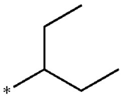
9-14

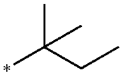
9-15

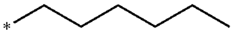
9-16

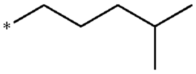
9-17

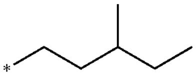
9-18

-continued
9-19
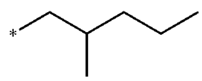
9-20
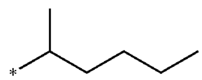
9-21
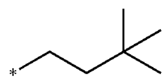
9-22
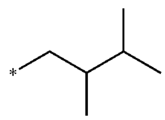
9-23
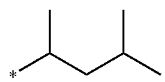
9-24
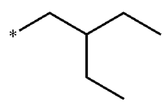
9-25
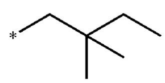
9-26
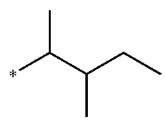
9-27
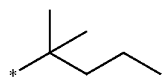
9-28
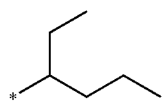
9-29
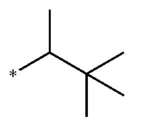
9-30
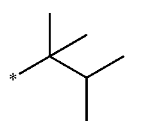
9-31
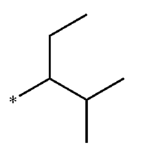
9-32
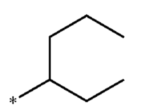
-continued
9-33
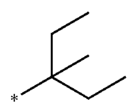
9-34
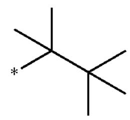
9-35
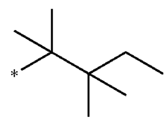
9-36
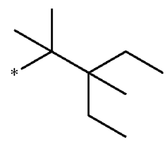
9-37
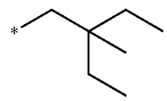
9-38
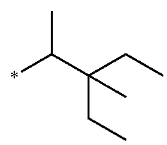
9-39
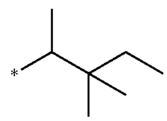
9-201
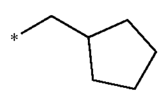
9-202
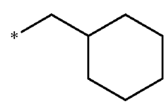
9-203
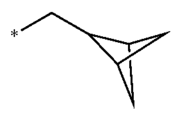
9-204
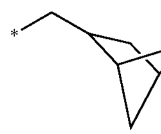
9-205
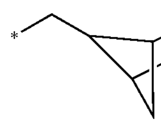
9-206
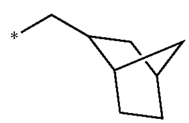

-continued
9-207
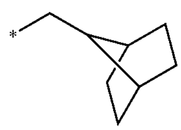
9-208
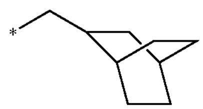
9-209
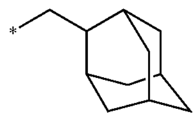
9-210
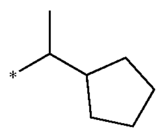
9-211
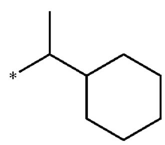
9-212
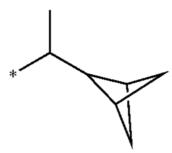
9-213
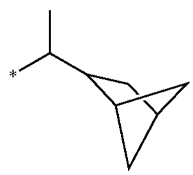
9-214
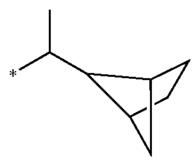
9-215
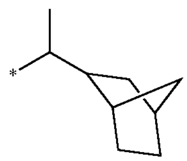
9-216
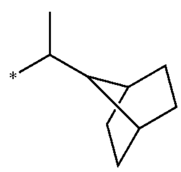
-continued
9-217
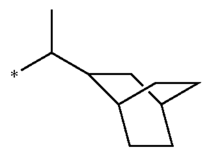
9-218
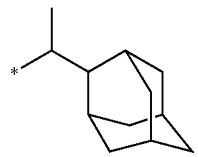
9-219
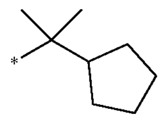
9-220
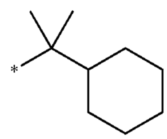
9-221
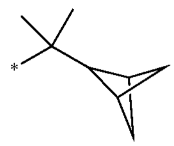
9-222
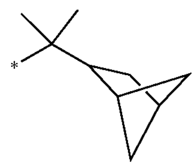
9-223
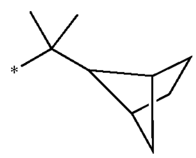
9-224
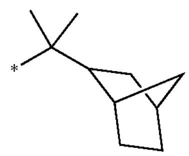
9-225
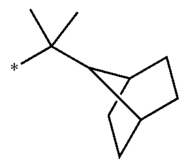
9-226
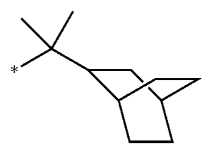

-continued
9-227
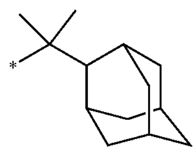
9-228
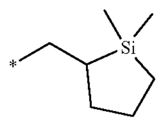
9-229
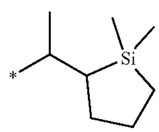
9-230
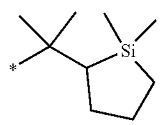
9-231
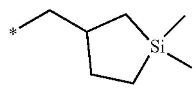
9-232
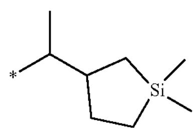
9-233
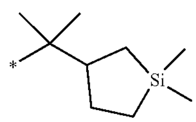
9-234
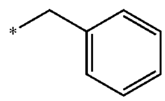
9-235
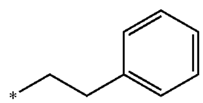
9-236
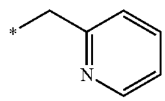
10-1
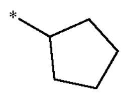
10-2
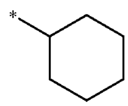
10-3
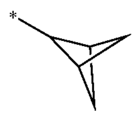
-continued
10-4
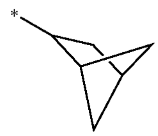
10-5
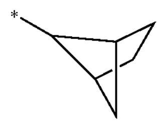
10-6
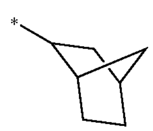
10-7
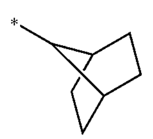
10-8
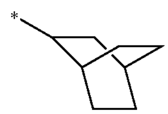
10-9
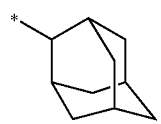
10-10
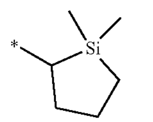
10-11
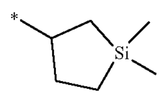
10-12
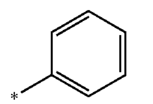
10-13
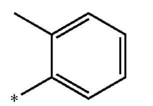
10-14
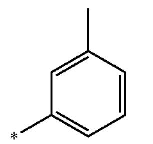
10-15
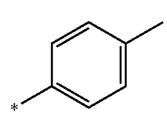

-continued
10-16
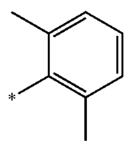
10-17
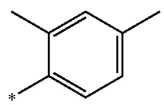
10-18
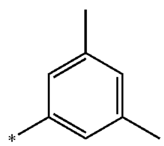
10-19
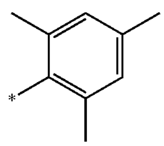
10-20
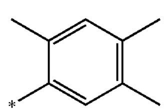
10-21
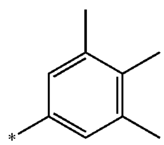
10-22
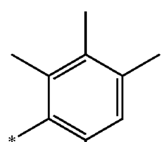
10-23
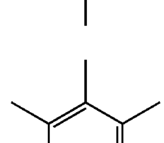
10-24
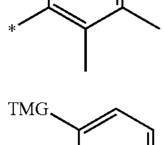
10-25
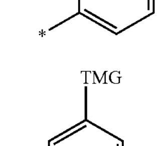
10-26
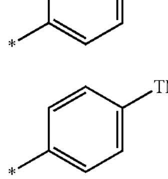
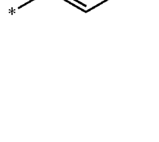
-continued
10-27
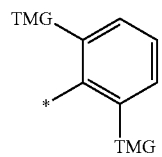
10-28
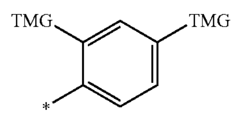
10-29
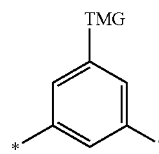
10-30
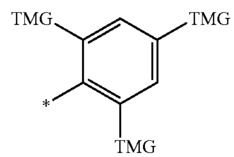
10-31
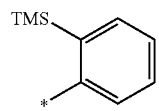
10-32
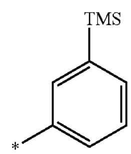
10-33
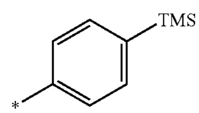
10-34
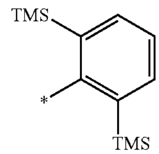
10-35
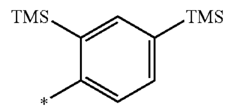
10-36
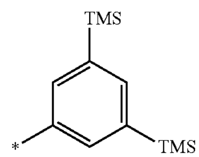
10-37
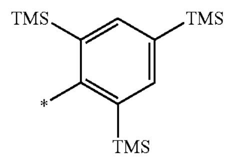

-continued
10-38
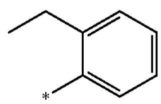
10-39
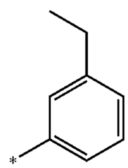
10-40
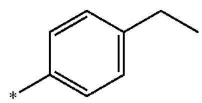
10-41
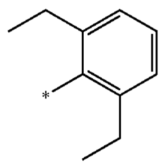
10-42
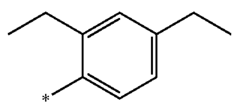
10-43
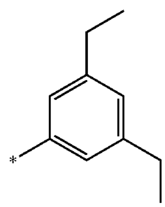
10-44
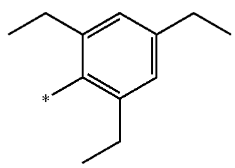
10-45
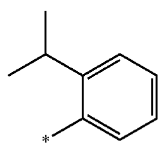
10-46
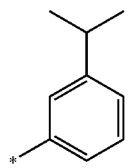
10-47
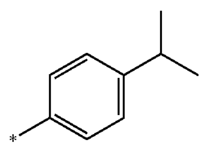
-continued
10-48
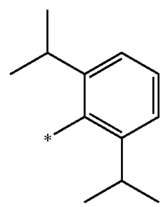
10-49
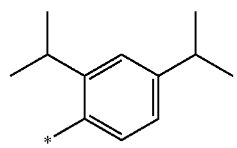
10-50
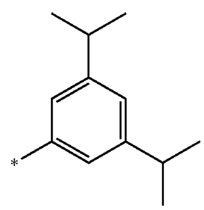
10-51
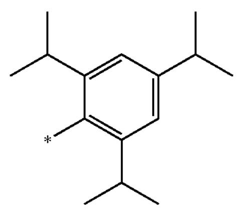
10-52
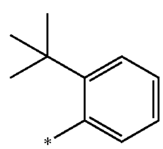
10-53
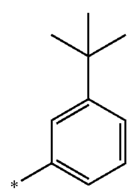
10-54
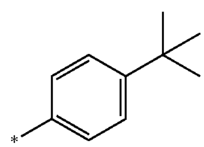
10-55
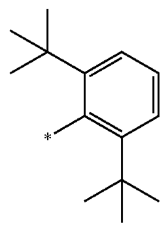

-continued
10-56
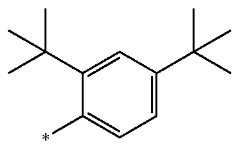
10-57
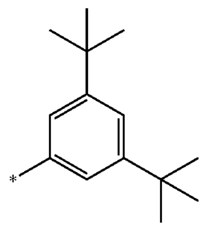
10-58
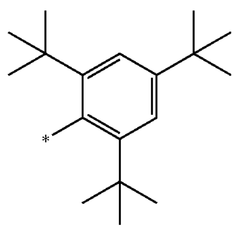
10-59
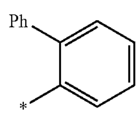
10-60
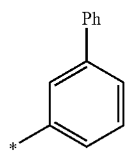
10-61
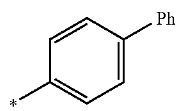
10-62
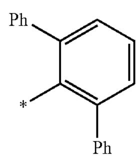
10-63
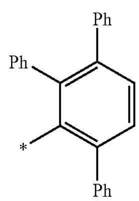
10-64
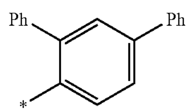
-continued
10-65
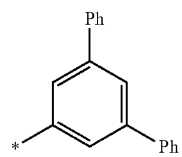
10-66
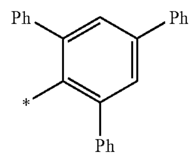
10-67
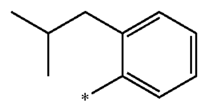
10-68
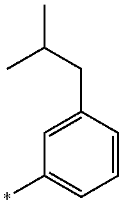
10-69
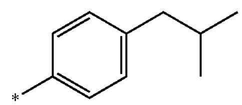
10-70
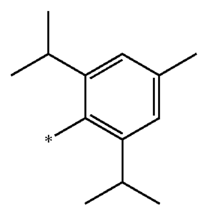
10-71
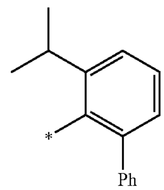
10-72
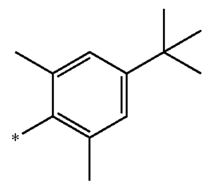
10-73
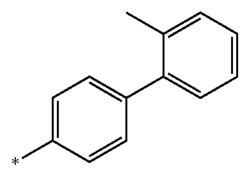

-continued
10-74
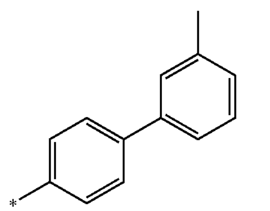
10-75
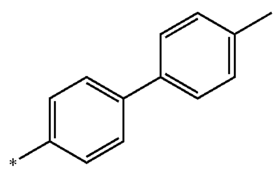
10-76
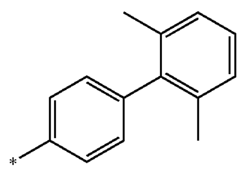
10-77
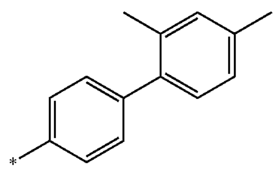
10-78
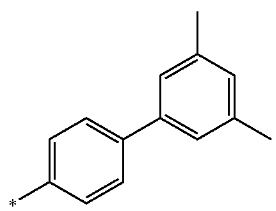
10-79
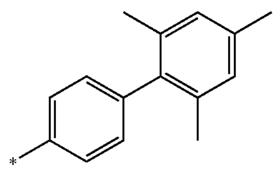
10-80
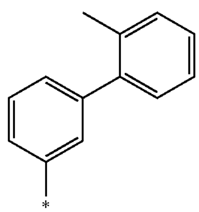
10-81
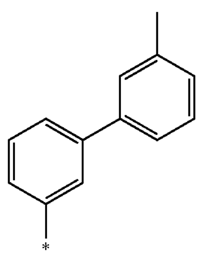
-continued
10-82
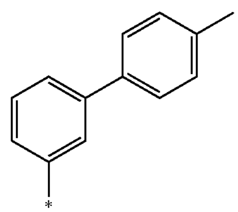
10-83
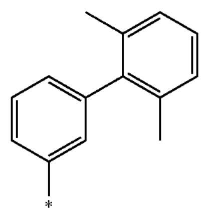
10-84
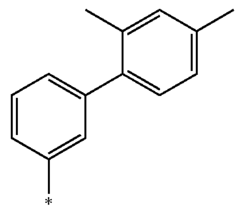
10-85
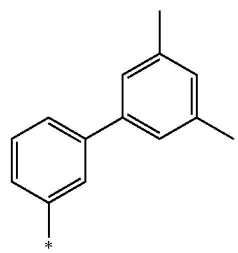
10-86
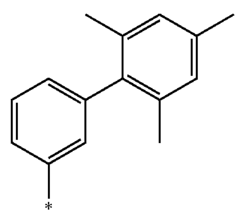
10-87
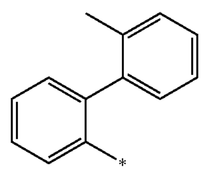
10-88
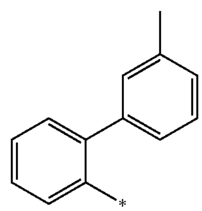

-continued
10-89
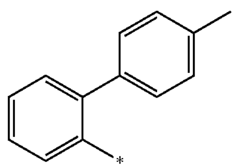
10-90
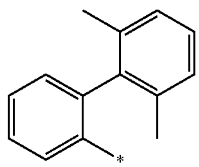
10-91
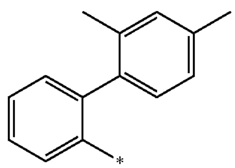
10-92
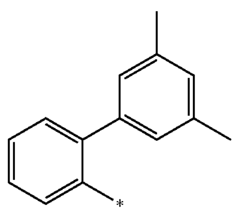
10-93
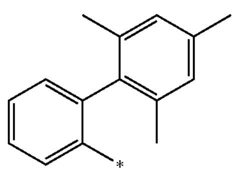
10-94
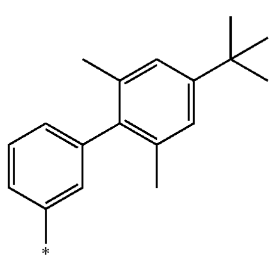
10-95
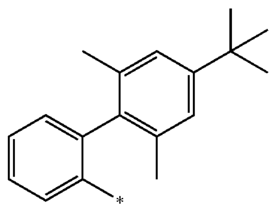
10-96
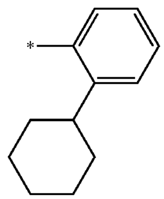
-continued
10-97
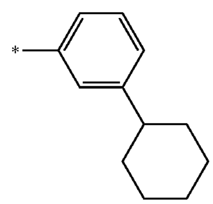
10-98
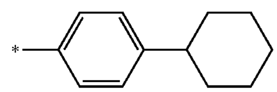
10-99
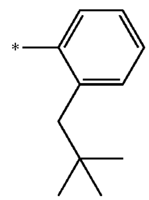
10-100
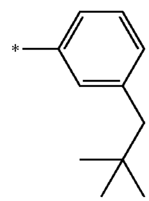
10-101
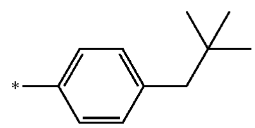
10-102
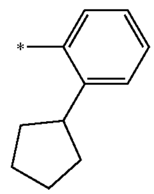
10-103
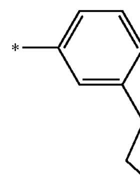
10-104
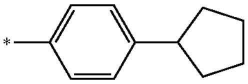
10-105
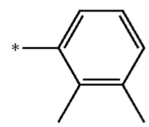
10-106
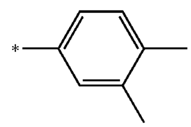

-continued
10-107
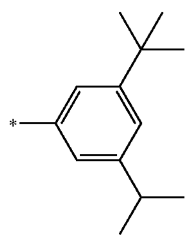
10-108
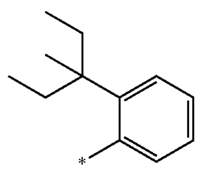
10-109
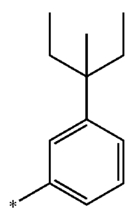
10-110
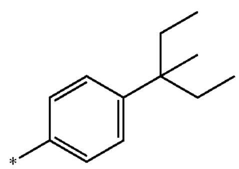
10-111
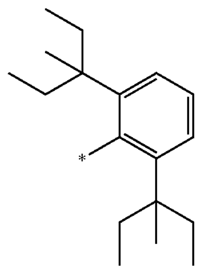
10-112
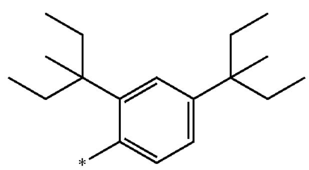
10-113
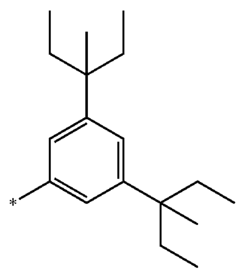
-continued
10-114
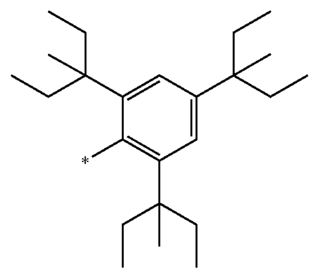
10-115
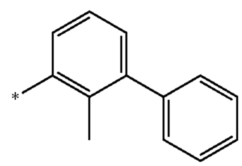
10-116
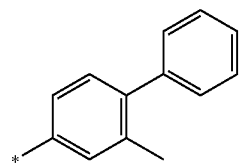
10-117
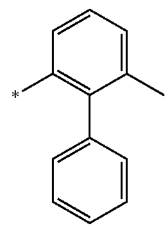
10-118
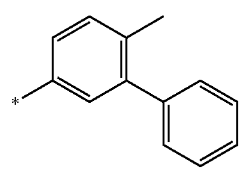
10-119
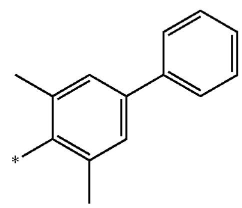
10-120
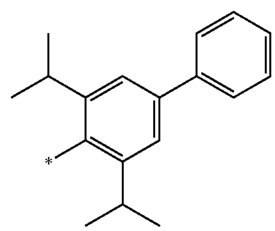
10-121
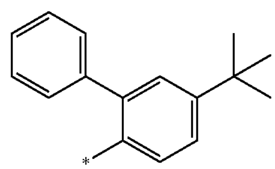

-continued
10-122
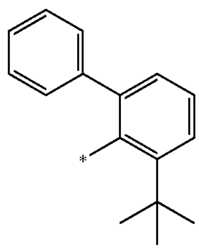
10-123
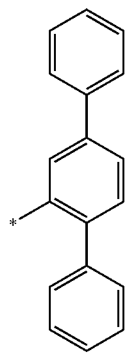
10-124
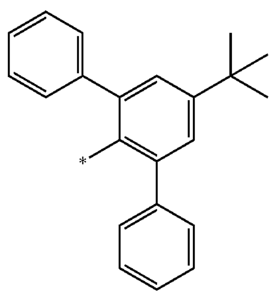
10-125
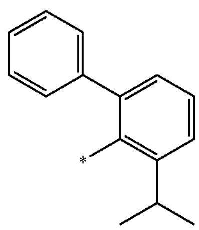
10-126
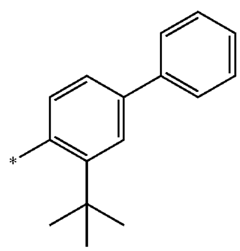
10-127
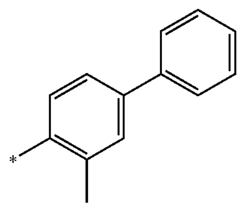
-continued
10-128
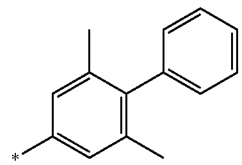
10-129
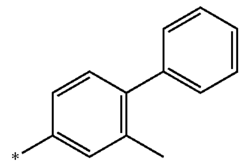
10-130
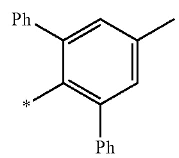
10-201
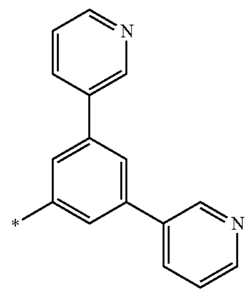
10-202
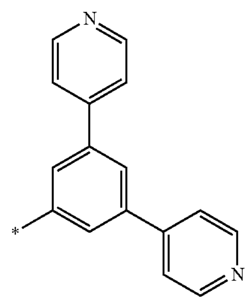
10-203
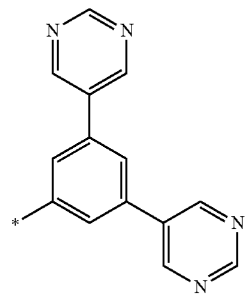

-continued
10-204
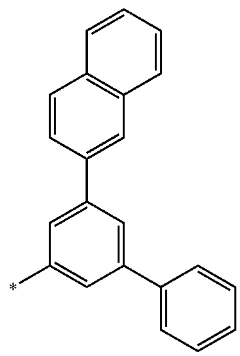
10-205
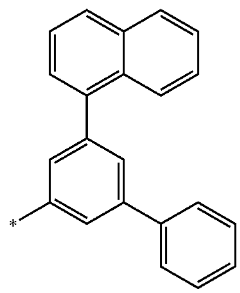
10-206
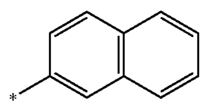
10-207
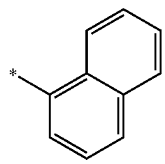
10-208
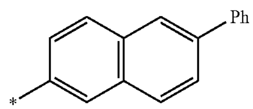
10-209
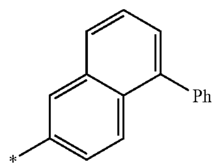
10-210
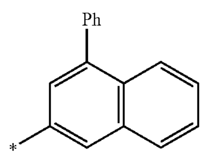
10-211
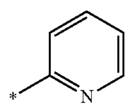
10-212
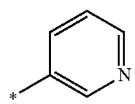
-continued
10-213
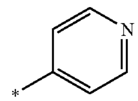
10-214
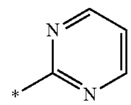
10-215
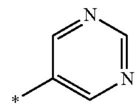
10-216
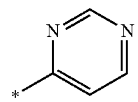
10-217
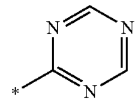
10-218
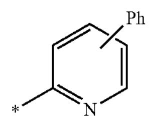
10-219
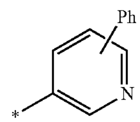
10-220
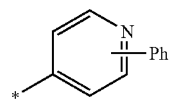
10-221
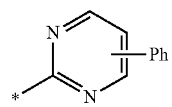
10-222
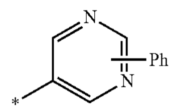
10-223
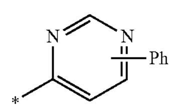
10-224
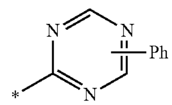
10-225
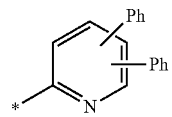

-continued
10-226
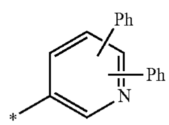
10-227
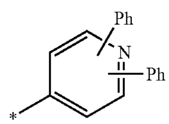
10-228
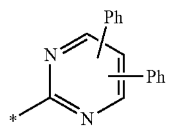
10-229
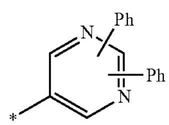
10-230
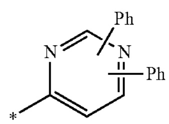
10-231
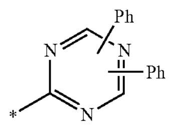
10-232
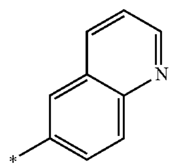
10-233
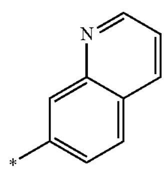
10-234
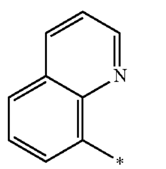
10-235
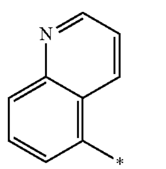
-continued
10-236
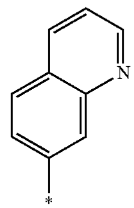
10-237
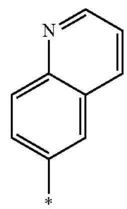
10-238
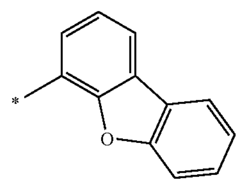
10-239
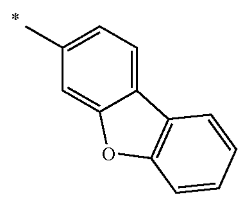
10-240
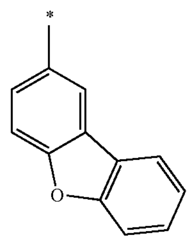
10-241
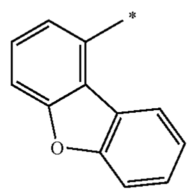
10-242
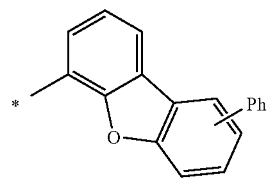

-continued
10-243
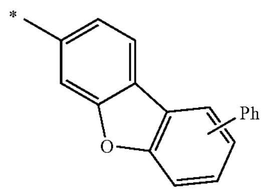
10-244
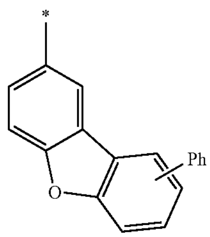
10-245
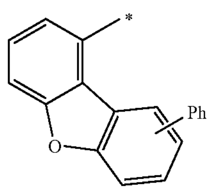
10-246
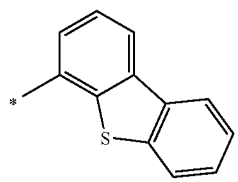
10-247
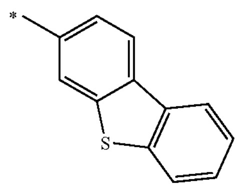
10-248
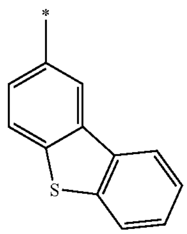
10-249
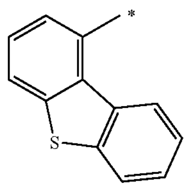
10-250
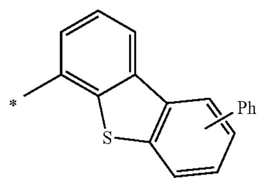
-continued
10-251
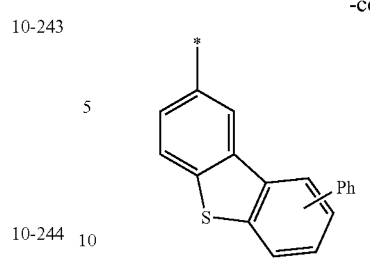
10-253
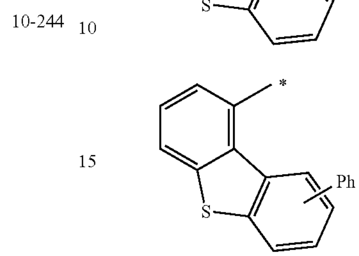
10-254
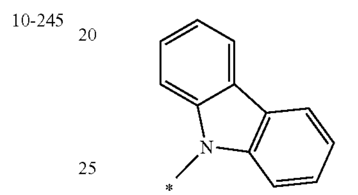
10-255
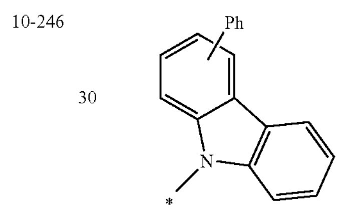
10-256
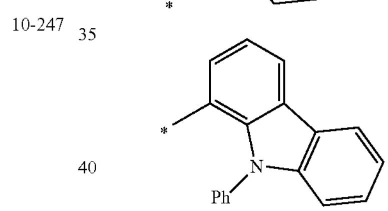
10-257
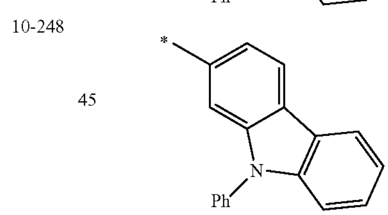
10-258
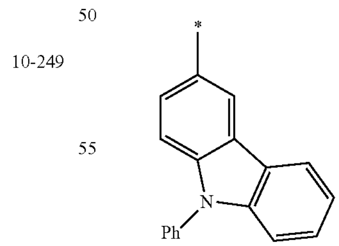
10-259
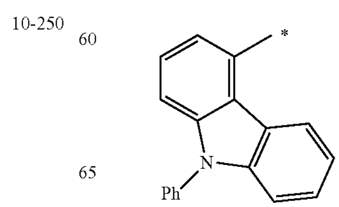

-continued
10-260
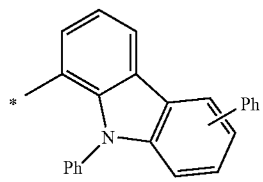
10-261
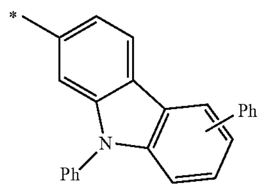
10-262
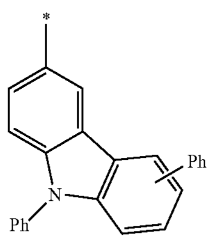
10-263
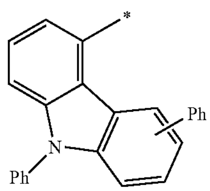
10-264
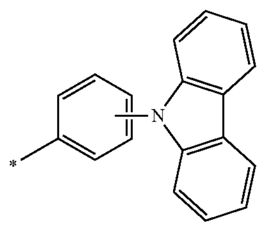
10-265
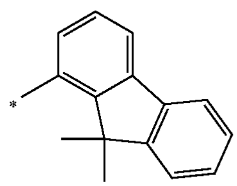
10-266
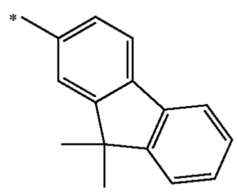
-continued
10-267
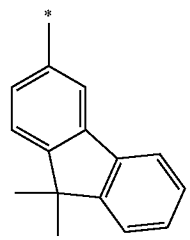
10-268
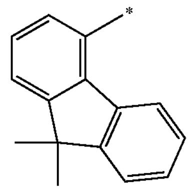
10-269
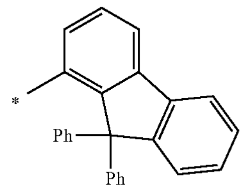
10-270
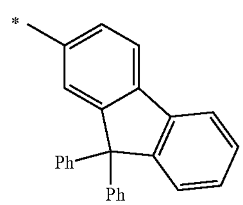
10-271
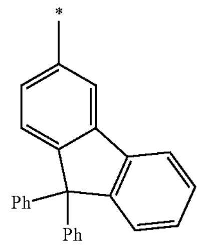
10-272
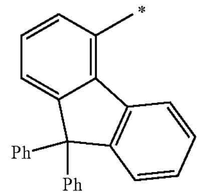
10-273
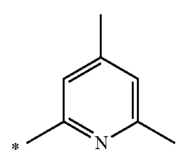
10-274
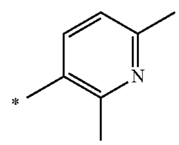

-continued
10-275
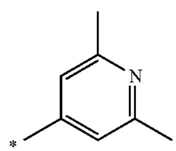
10-276
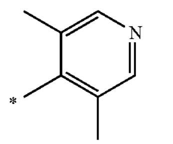
10-277
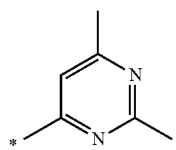
10-278
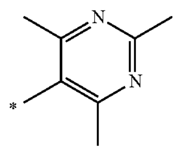
10-279
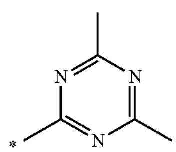
10-280
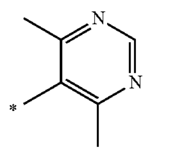
10-281
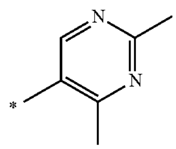
10-282
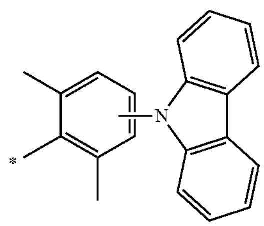
10-283
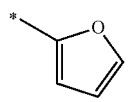
10-284
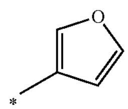
-continued
10-285
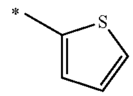
10-286
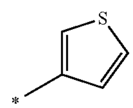
10-287
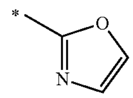
10-288
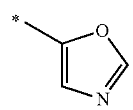
10-289
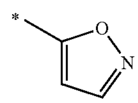
10-290
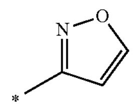
10-291
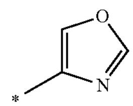
10-292
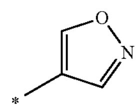
10-293
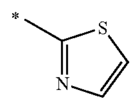
10-294
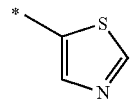
10-295
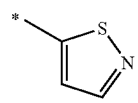
10-296
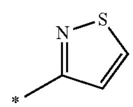
10-297
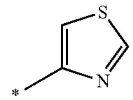

-continued
10-299
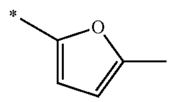
10-300
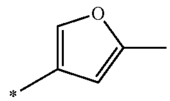
10-301
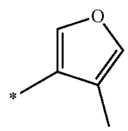
10-302
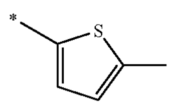
10-303
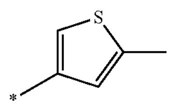
10-304
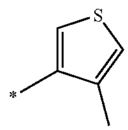
10-305
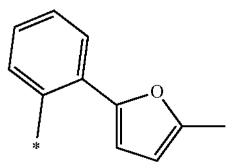
10-306
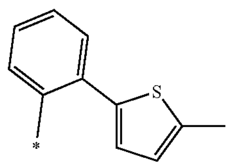
10-307
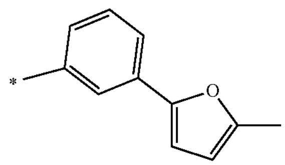
10-308
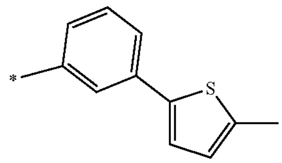
10-309
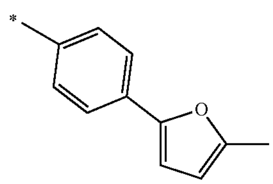
-continued
10-310
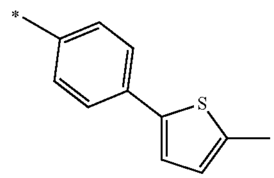
10-311
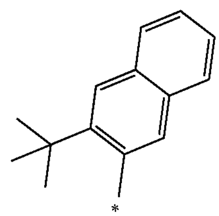
10-312
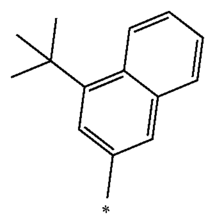
10-313
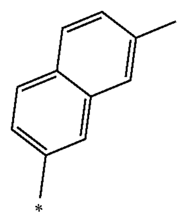
10-314
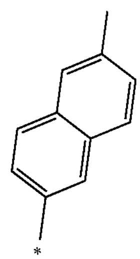
10-315
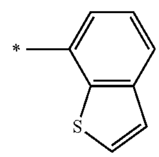
10-316
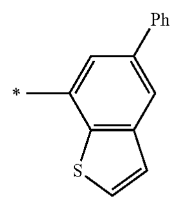

-continued
10-317
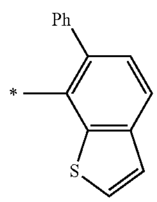
10-318
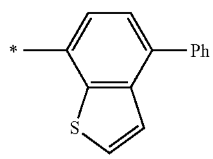
10-319
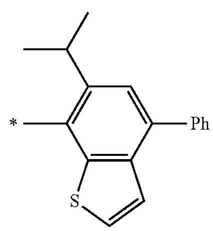
10-320
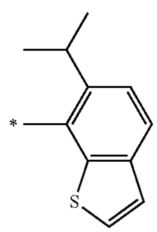
10-321
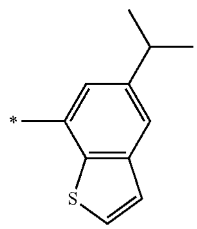
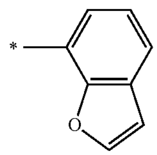
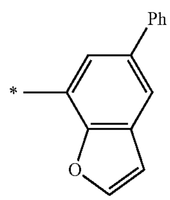
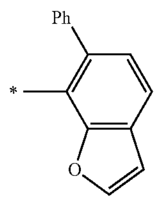
-continued
10-325
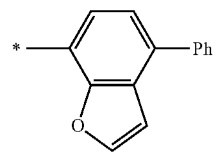
10-326
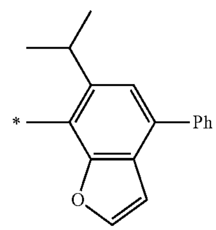
10-327
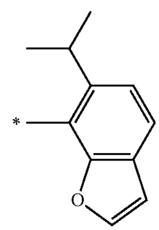
10-328
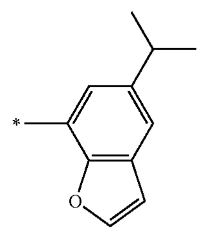
10-329
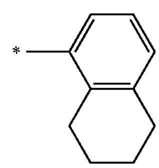
10-330
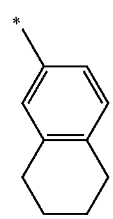
10-331
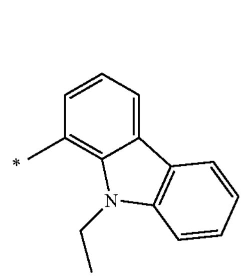

-continued
10-332
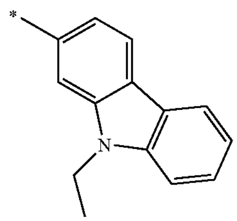
10-333
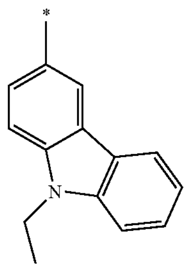
10-334
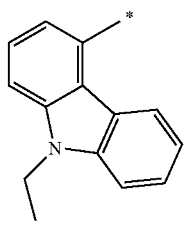
10-335
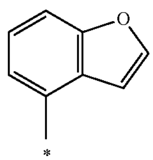
10-336
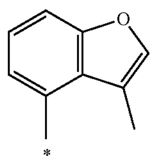
10-337
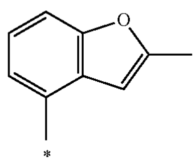
10-338
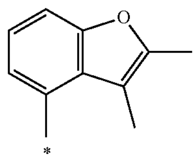
10-339
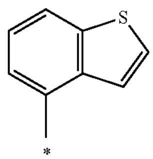
-continued
10-340
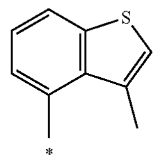
10-341
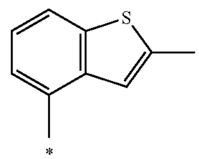
10-342
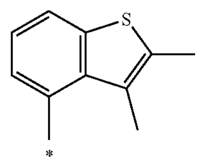
10-343
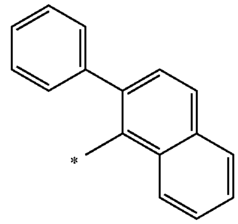
10-344
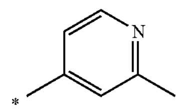
10-345
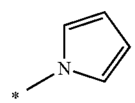
10-346
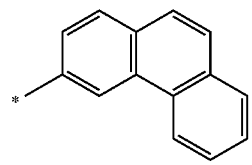
10-347
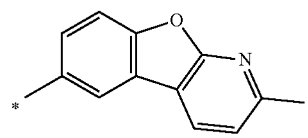
10-348
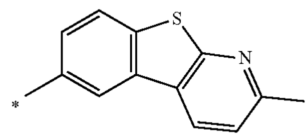
10-349
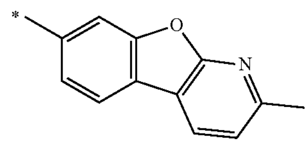

-continued 10-350

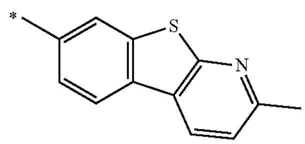

10-351

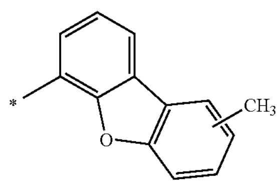

10-352

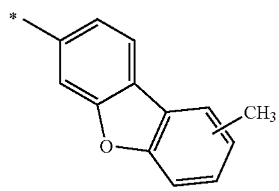

10-353

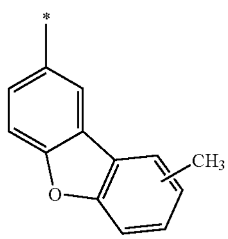

10-354

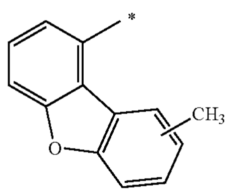

10-355

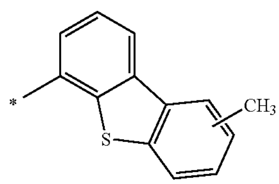

10-356

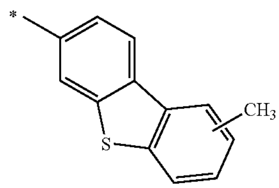

10-357

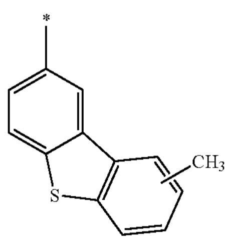

-continued 10-358

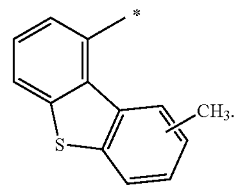

In Formulae 9-1 to 9-39, 9-201 to 9-236, 10-1 to 10-130, and 10-201 to 10-358, * indicates a binding site to a neighboring atom, Ph represents a phenyl group, TMS and $SiMe_3$ each represent a trimethylsilyl group, and TMG and $GeMe_3$ each represent a trimethylgermyl group.

The "group represented by one of Formulae 9-1 to 9-39 in which at least one hydrogen is substituted with deuterium" and the "group represented by one of Formulae 9-201 to 9-236 in which at least one hydrogen is substituted with deuterium" may each independently be, for example, a group represented by one of Formulae 9-501 to 9-514 and 9-601 to 9-636:

9-501

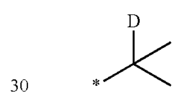

9-502

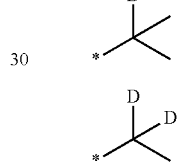

9-503

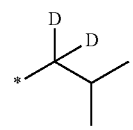

9-504

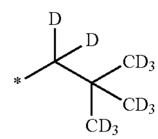

9-505

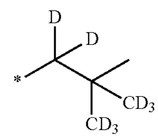

9-506

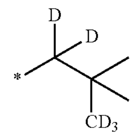

9-507

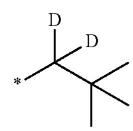

9-508

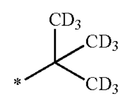

-continued
9-509
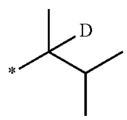
9-510
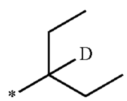
9-511
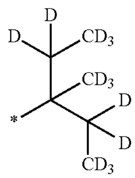
9-512
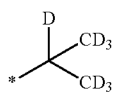
9-513
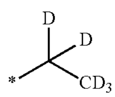
9-514
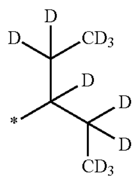
9-601
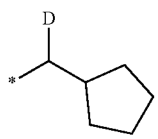
9-602
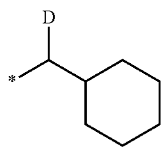
9-603
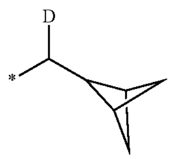
9-604
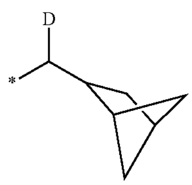
-continued
9-605
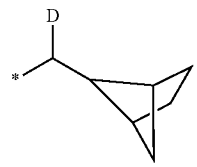
9-606
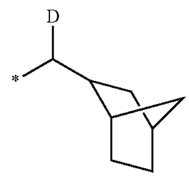
9-607
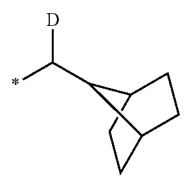
9-608
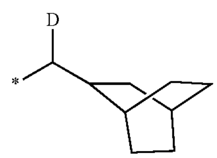
9-609
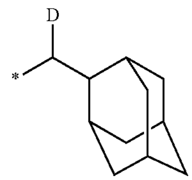
9-610
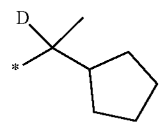
9-611
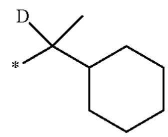
9-612
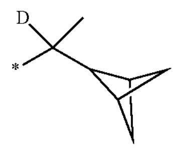
9-613
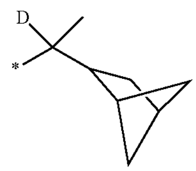

-continued
9-614
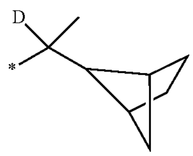
9-615
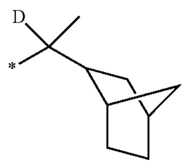
9-616
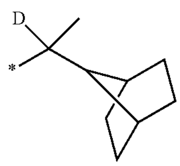
9-617
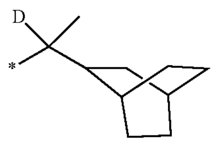
9-618
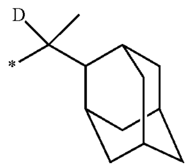
9-619
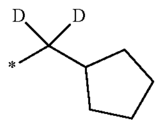
9-620
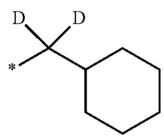
9-621
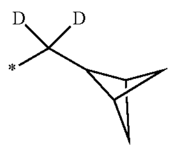
9-622
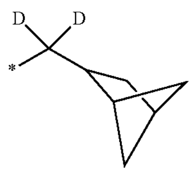
9-623
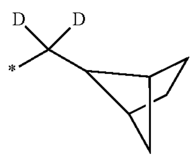
-continued
9-624
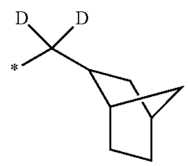
9-625
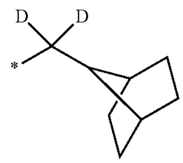
9-626
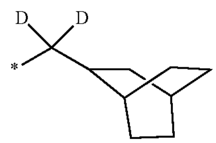
9-627
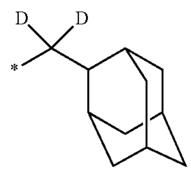
9-628
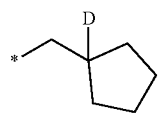
9-629
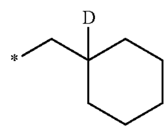
9-630
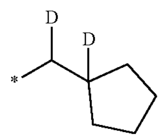
9-631
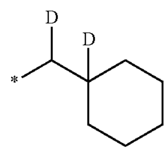
9-632
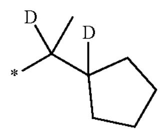
9-633
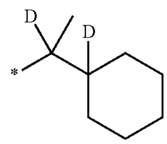

-continued 9-634

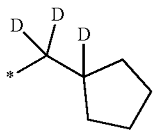

9-635

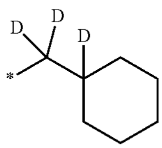

9-636

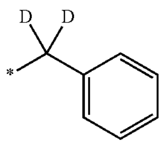

The "group represented by one of Formulae 9-1 to 9-39 in which at least one hydrogen is substituted with —F" and the "group represented by one of Formulae 9-201 to 9-236 in which at least one hydrogen is substituted with —F" may each independently be, for example, a group represented by one of Formulae 9-701 to 9-710:

9-701

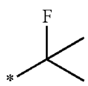

9-702

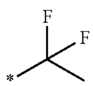

9-703

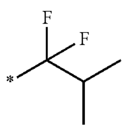

9-704

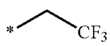

9-705

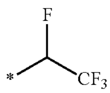

9-706

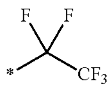

9-707

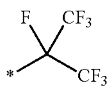

9-708

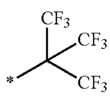

9-709

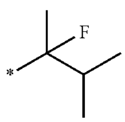

-continued 9-710

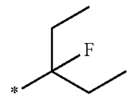

The "group in which at least one hydrogen of one of Formulae 10-1 to 10-130 is substituted with deuterium" and "the group in which at least one hydrogen of one of Formulae 10-201 to 10-358 is substituted with deuterium" may each independently be, for example, a group represented by one of Formulae 10-501 to 10-576:

10-501

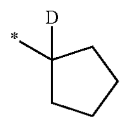

10-502

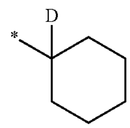

10-503

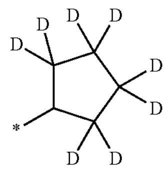

10-504

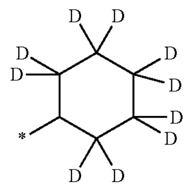

10-505

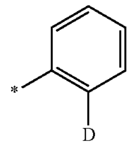

10-506

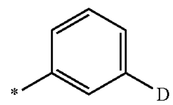

10-507

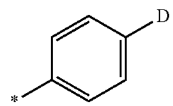

10-508

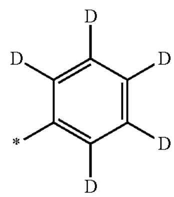

-continued
10-509
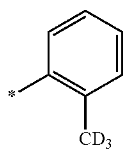
10-510
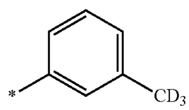
10-511
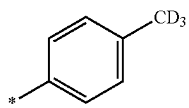
10-512
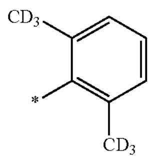
10-513
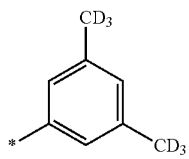
10-514
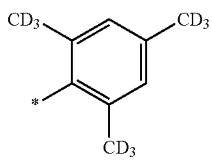
10-515
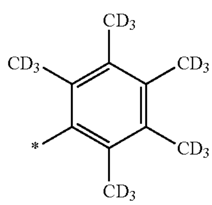
10-516
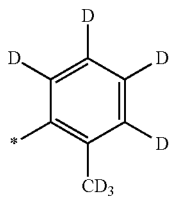
10-517
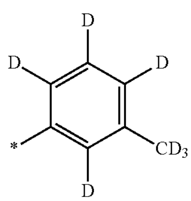
-continued
10-518
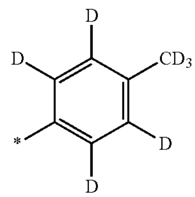
10-519
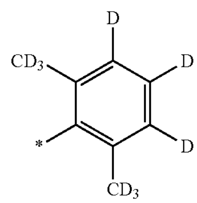
10-520
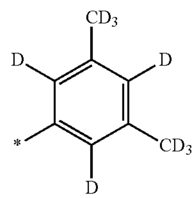
10-521
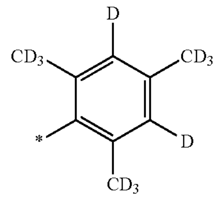
10-522
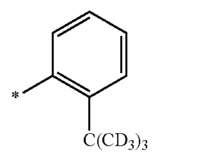
10-523
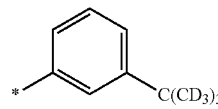
10-524
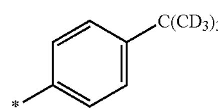
10-525
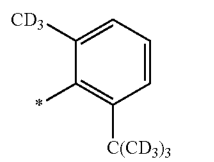
10-526
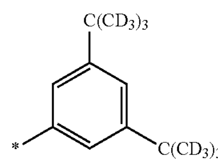

-continued
10-527
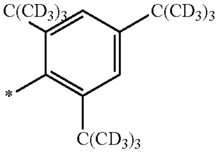
10-528
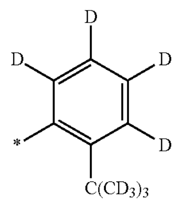
10-529
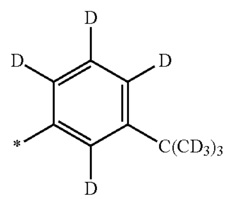
10-530
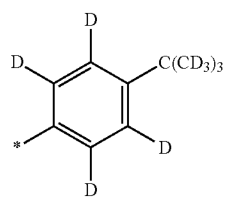
10-531
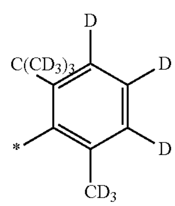
10-532
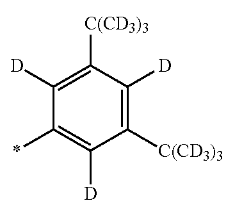
10-533
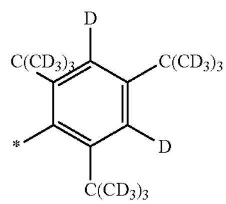
10-534
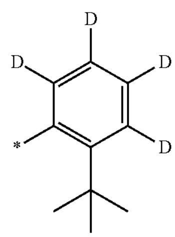
-continued
10-535
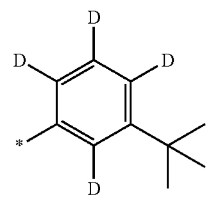
10-536
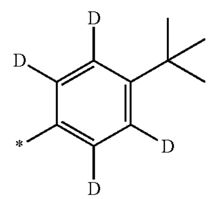
10-537
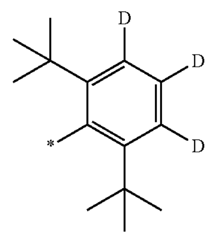
10-538
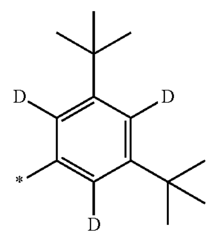
10-540
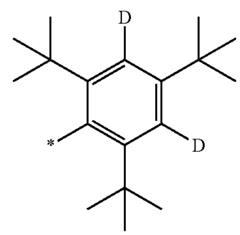
10-541
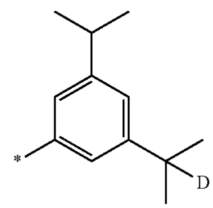
10-542
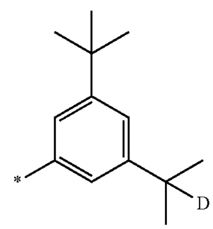

-continued
10-543
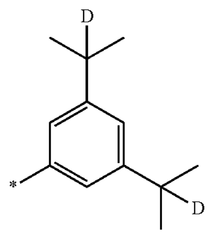
10-544
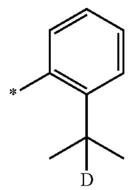
10-545
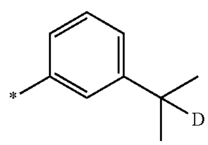
10-546
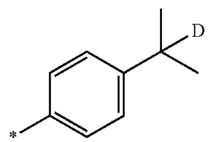
10-547
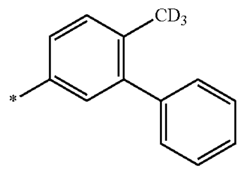
10-548
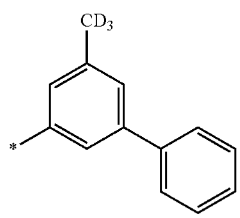
10-549
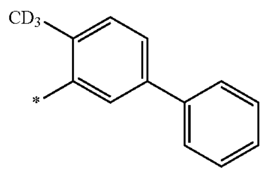
10-550
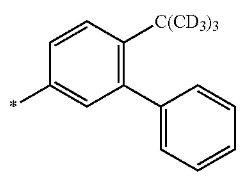
-continued
10-551
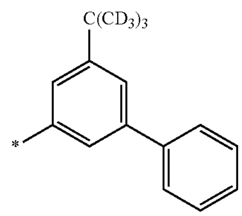
10-552
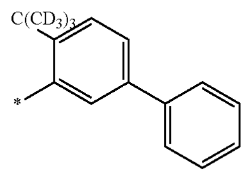
10-553
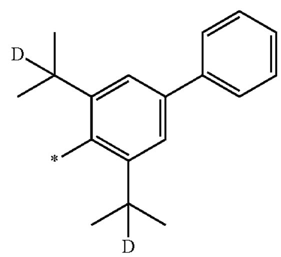
10-554
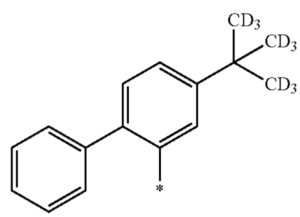
10-555
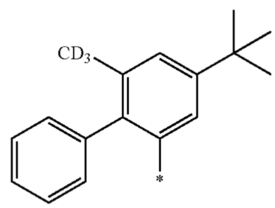
10-556
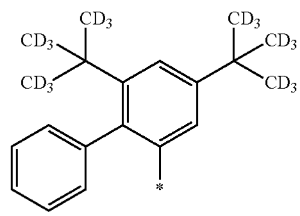
10-557
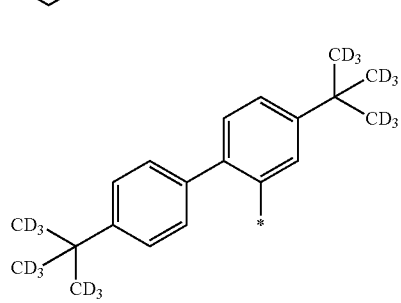
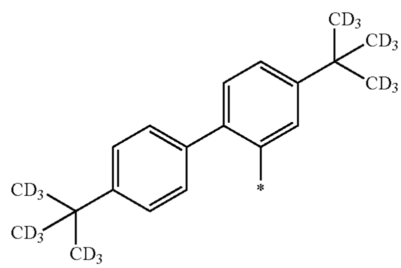

-continued
10-558
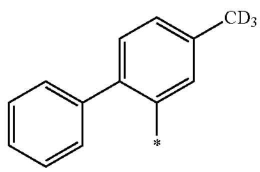
10-559
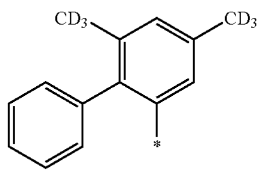
10-560
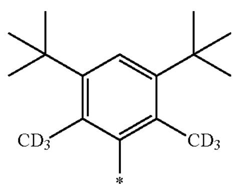
10-561
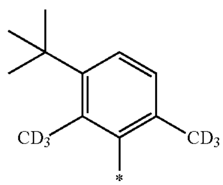
10-562
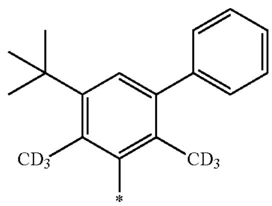
10-563
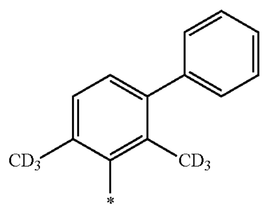
10-564
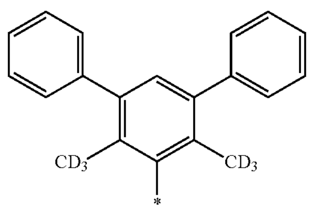
10-565
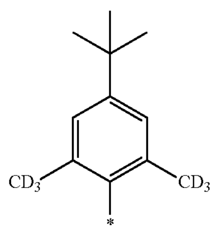
-continued
10-566
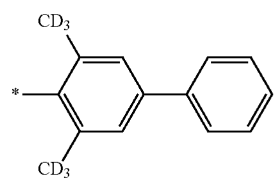
10-567
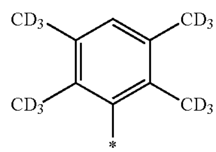
10-568
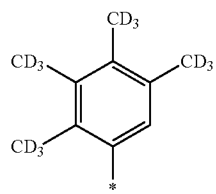
10-569
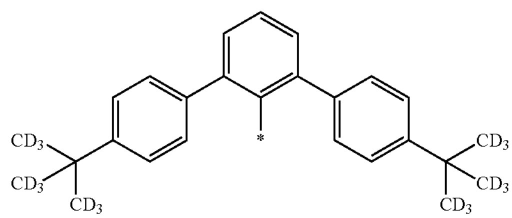
10-570
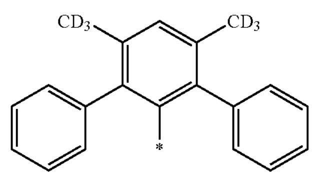
10-571
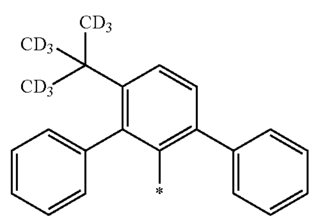
10-572
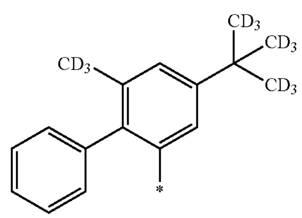
10-573
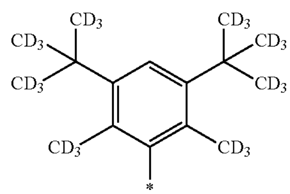

-continued
10-574
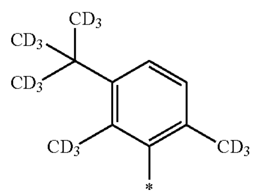
10-575
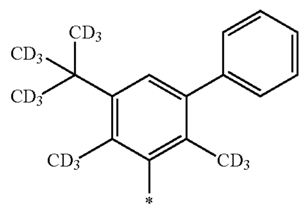
10-576
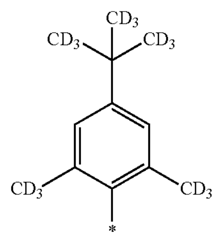
The "group in which at least one hydrogen of one of Formulae 10-1 to 10-130 is substituted with —F" and "the group in which at least one hydrogen of one of Formulae 10-201 to 10-358 is substituted with —F" may each independently be, for example, a group represented by one of Formulae 10-601 to 10-617:
10-601
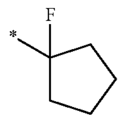
10-602
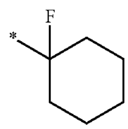
10-603
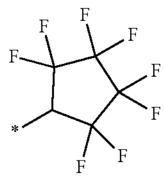
10-604
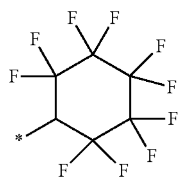
-continued
10-605
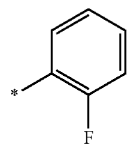
10-606
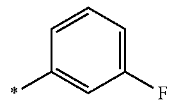
10-607
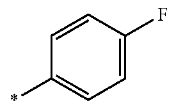
10-608
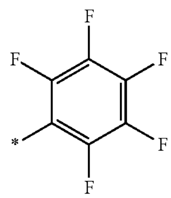
10-609
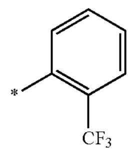
10-610
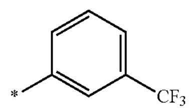
10-611
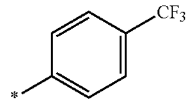
10-612
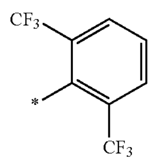
10-613
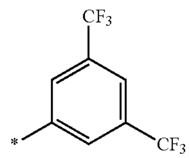
10-614
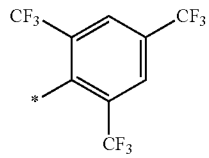

-continued 10-615

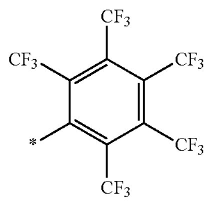

10-616

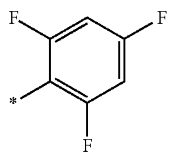

10-617

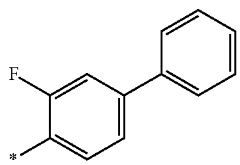

In an embodiment, in Formulae 1-1 and 1-2, $X_{11}$ to $X_{16}$ may each independently be a group represented by Formula 2-11 or 2-21:

Formula 2-11

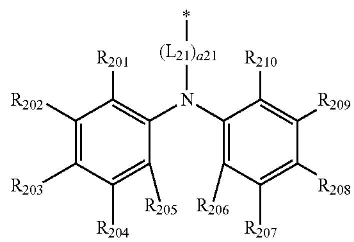

Formula 2-21

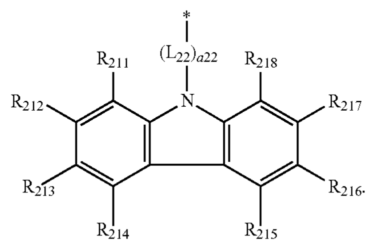

In Formulae 2-11 and 2-21, $L_{21}$ and $L_{22}$ may respectively be the same as described herein, a21 and a22 may each independently be 0 or 1, and $R_{201}$ to $R_{218}$ may each independently be hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group.

In one or more embodiments, in Formulae 1-1 and 1-2, $X_{11}$ to $X_{16}$ may each independently be represented by one of Formulae 2-111 to 2-122:

2-111

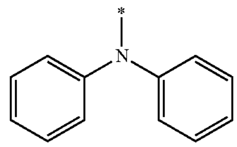

2-112

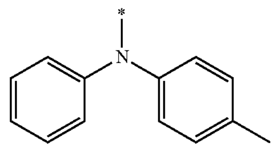

2-113

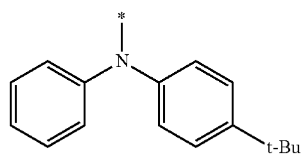

2-114

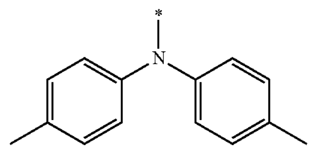

2-115

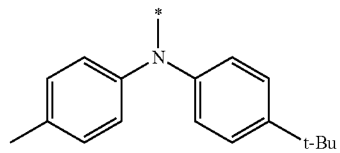

2-116

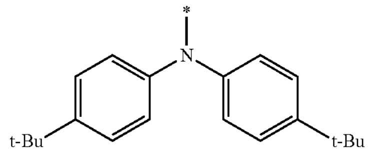

2-117

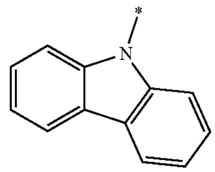

2-118

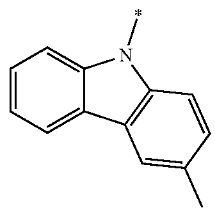

-continued 2-119

2-120

2-121

2-122

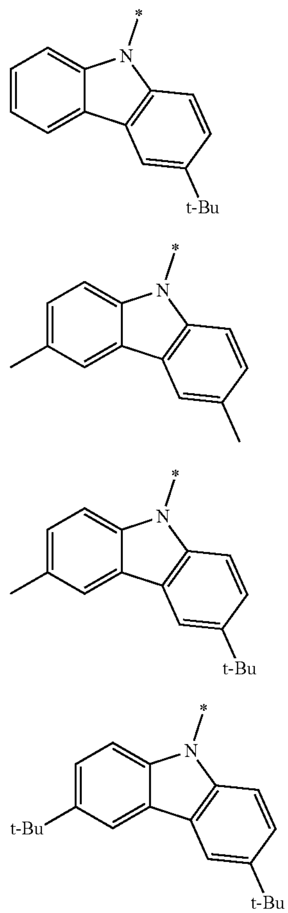

In Formulae 2-111 to 2-122, t-Bu represents a tert-butyl group, and

* indicates a binding site to a neighboring atom.

In Formulae 1-1 and 1-2, n11 to n16 may each independently be 0, 1, or 2. Here, n11 to n16 indicate the number of substitutions, $X_{11}$ to $X_{16}$, respectively.

The sum of n11 to n16 in Formula 1-1 may be 1 or more, and the sum of n11 to n15 in Formula 1-2 may be 1 or more.

In an embodiment, the sum of n11 to n15 in Formula 1-1 may be 1 or more.

In an embodiment, the sum of n11 to n15 in Formulae 1-1 and 1-2 may be 1 or 2.

In an embodiment, in Formulae 1-1 and 1-2, $Y_{11}$ to $Y_{16}$ may each independently be a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group.

In one or more embodiments, in Formulae 1-1 and 1-2, $Y_{11}$ to $Y_{16}$ may each independently be a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, or a chrysenyl group, each substituted or unsubstituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

In one or more embodiments, in Formulae 1-1 and 1-2, $Y_{11}$ to $Y_{16}$ may each independently be hydrogen, deuterium, —F, —$CH_3$, —$CD_3$, —$CD_2H$, —$CDH_2$, —$CF_3$, —$CF_2H$, —$CFH_2$, a $C_2$-$C_{10}$ alkenyl group, a $C_1$-$C_{10}$ alkoxy group, a $C_1$-$C_{10}$ alkylthio group, a group represented by one of Formulae 10-12 to 10-23 and 10-38 to 10-130, a group represented by one of Formulae 10-12 to 10-23 and 10-38 to 10-130 in which at least one hydrogen is substituted with deuterium group, or a group represented by one of Formulae 10-12 to 10-23 and 10-38 to 10-130 in which at least one hydrogen is substituted with —F:

10-12

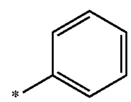

10-13

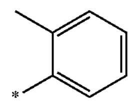

10-14

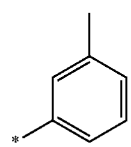

10-15

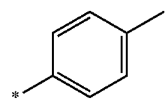

-continued
10-16
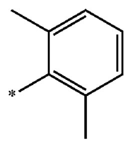
10-17
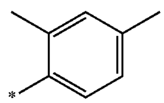
10-18
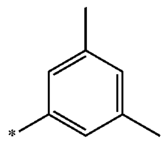
10-19
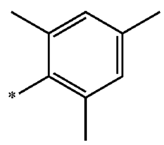
10-20
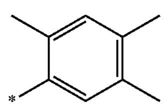
10-21
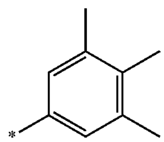
10-22
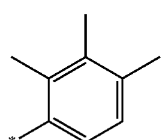
10-23
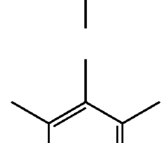
10-38
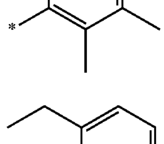
10-39
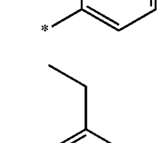
10-40
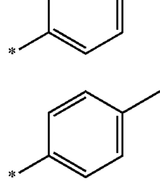
-continued
10-41
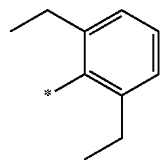
10-42
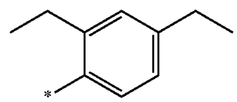
10-43
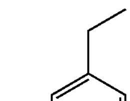
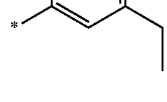
10-44
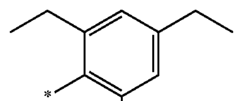
10-45
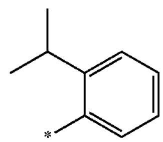
10-46
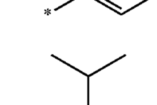
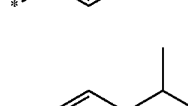
10-47
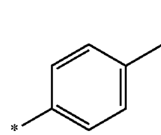
10-48
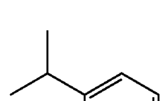
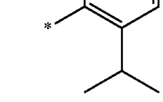
10-49
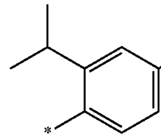
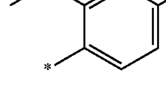

-continued
10-50
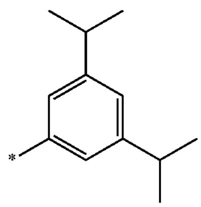
10-51
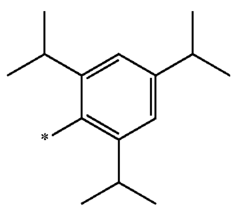
10-52
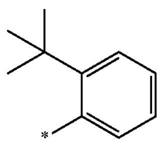
10-53
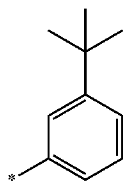
10-54
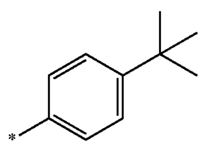
10-55
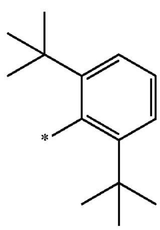
10-56
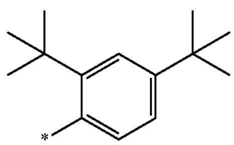
10-57
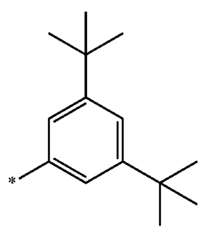
-continued
10-58
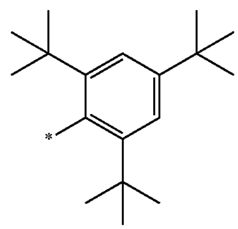
10-59
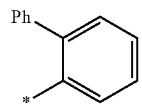
10-60
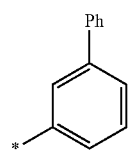
10-61
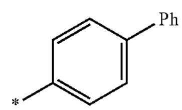
10-62
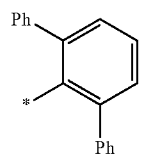
10-63
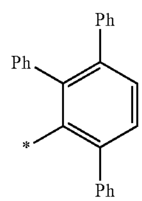
10-64
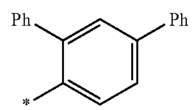
10-65
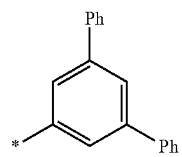
10-66
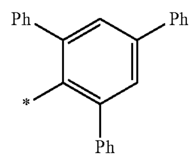
10-67
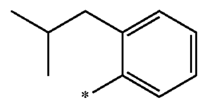

-continued
10-68
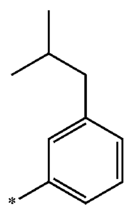
10-69
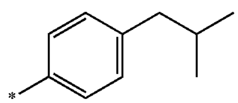
10-70
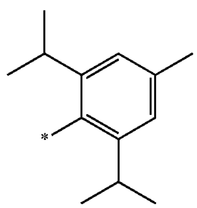
10-71
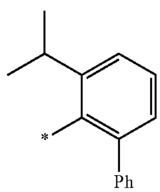
10-72
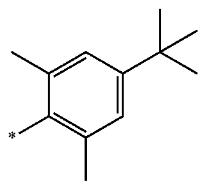
10-73
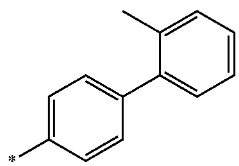
10-74
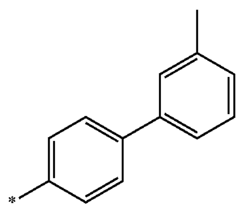
10-75
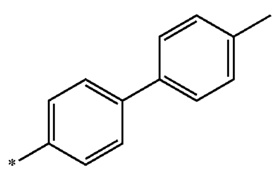
-continued
10-76
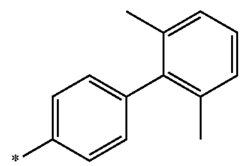
10-77
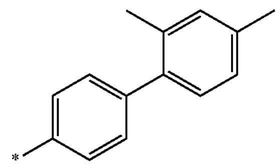
10-78
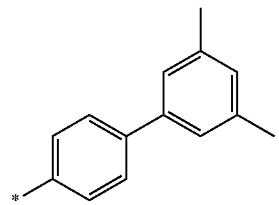
10-79
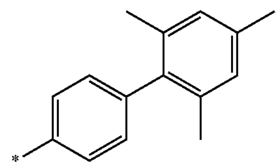
10-80
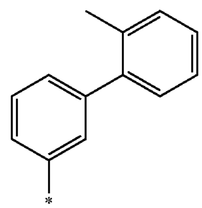
10-81
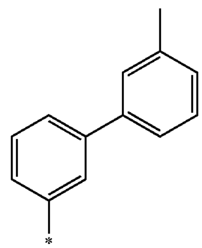
10-82
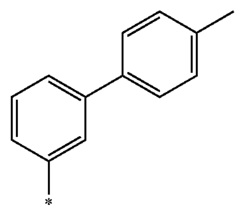
10-83
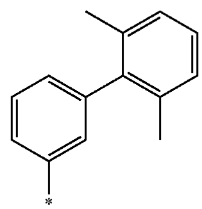

-continued
10-84
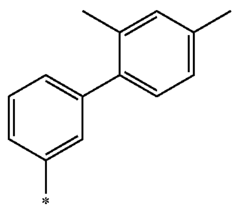
10-85
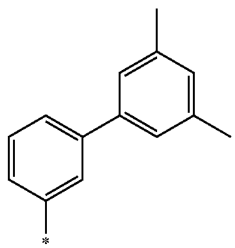
10-86
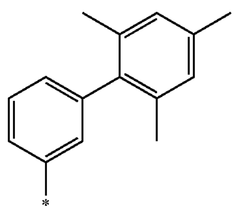
10-87
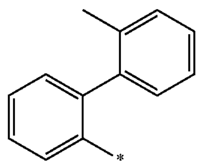
10-88
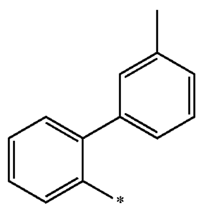
10-89
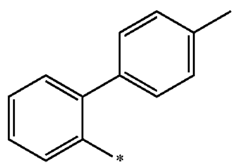
10-90
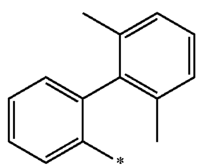
10-91
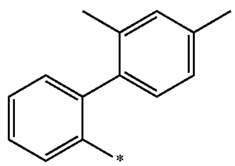
-continued
10-92
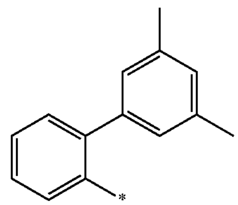
10-93
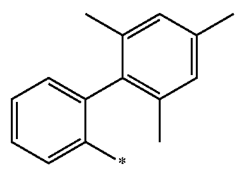
10-94
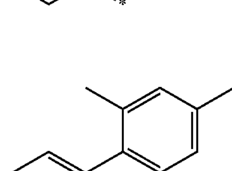
10-95
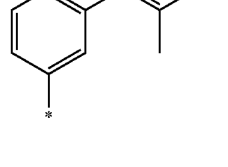
10-96
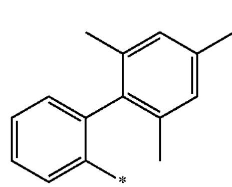
10-97
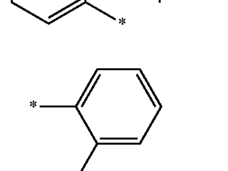
10-98
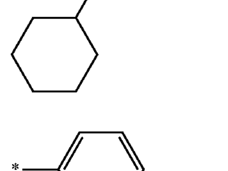
10-99
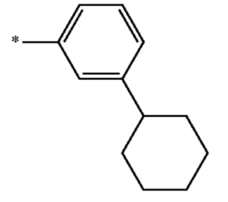
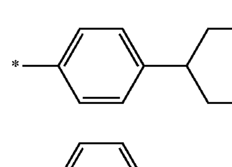
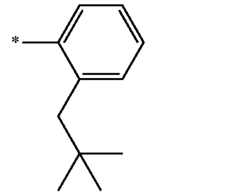

-continued
10-100
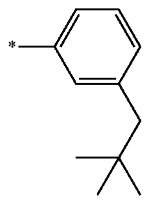
10-101
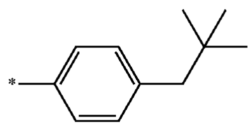
10-102
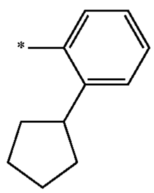
10-103
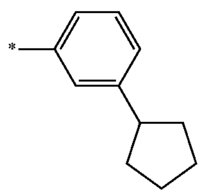
10-104
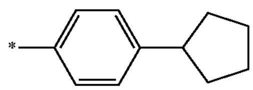
10-105
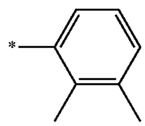
10-106
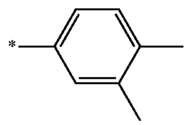
10-107
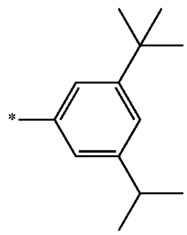
10-108
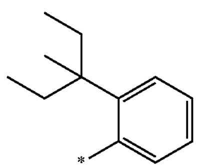
-continued
10-109
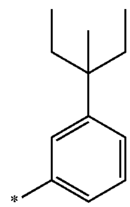
10-110
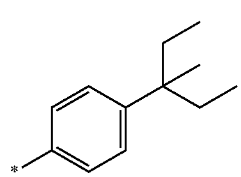
10-111
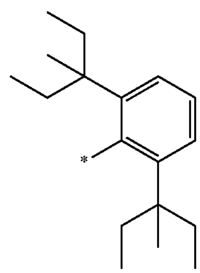
10-112
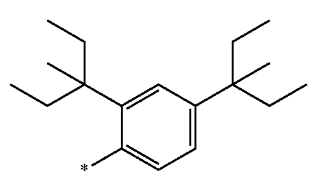
10-113
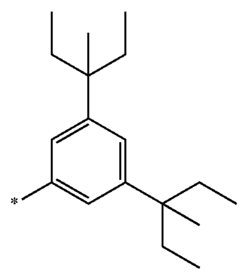
10-114
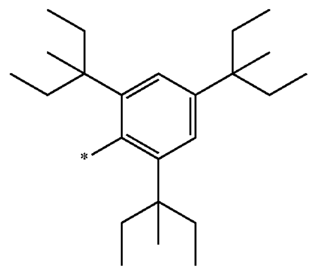
10-115
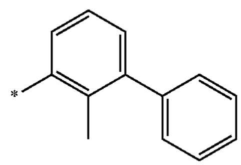

-continued
10-116
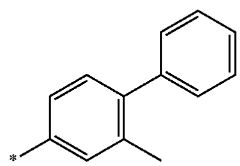
10-117
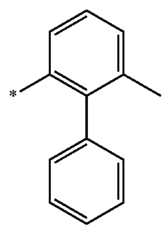
10-118
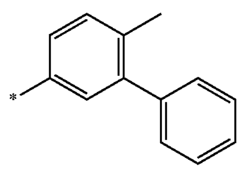
10-119
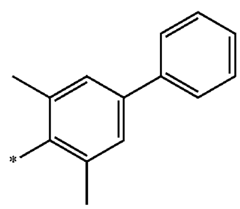
10-120
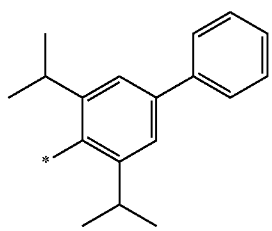
10-121
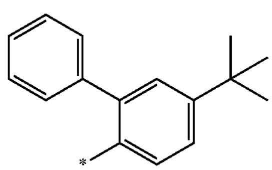
10-122
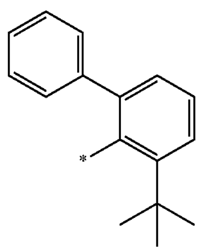
-continued
10-123
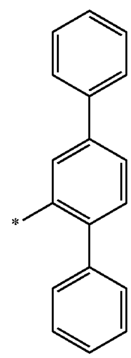
10-124
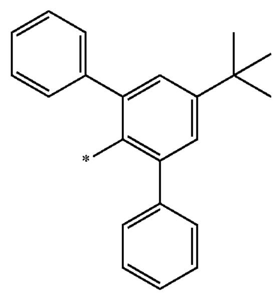
10-125
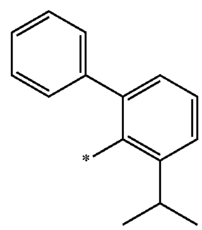
10-126
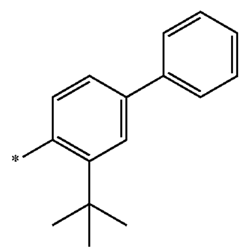
10-127
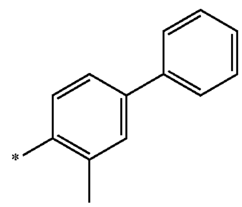
10-128
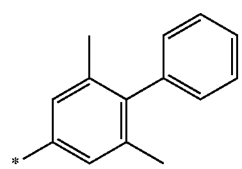

-continued 10-129

10-130

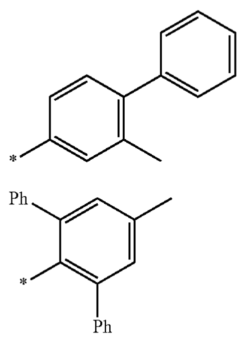

In Formulae 10-12 to 10-23 and 10-38 to 10-130,

"Ph" represents a phenyl group, and

* indicates a binding site to a neighboring atom.

In Formulae 1-1 and 1-2, m11 to m16 may each independently be 0, 1, or 2. In Formulae 1-1 and 1-2, m11 to m16 indicate the number of substituents, $Y_{11}$ to $Y_{16}$, respectively.

In an embodiment, the sum of m11 to m16 in Formula 1-1 may be 1 or more, and the sum of m11 to m15 in Formula 1-2 may be 1 or more.

In one or more embodiments, in Formulae 1-1 and 1-2, the sum of m11 to m15 may be 1 or more.

In one or more embodiments, in Formulae 1-1 and 1-2, m11 to m15 may each independently be 1 or 2.

In Formula 1-1, the sum of n11 to n16 and m11 to m16 may be 2 or more. In Formula 1-2, the sum of n11 to n15 and m11 to m15 may be 2 or more.

In an embodiment, in Formulae 1-1 and 1-2, the sum of n11 to n15 and m11 to m15 may be 2, 3, 4, or 5.

In one or more embodiments, in Formulae 1-1 and 1-2, the sum of n11 to n15 and m11 to m15 may be 4 or 5.

In Formulae 1-1 and 1-2, $Z_{11}$ to $Z_{16}$ may each independently be a carbon atom, and a bond between $Z_{11}$ and $Z_{12}$, a bond between $Z_{13}$ and $Z_{14}$, and a bond between $Z_{15}$ and $Z_{16}$ may each independently be a single bond or a double bond.

In Formulae 1-1 and 1-2, $R_{11}$ to $R_1$, may each independently be the same as described in connection with $R_{23}$.

In Formulae 1-1 and 1-2, b11 to b16 may each independently be 0, 1, 2, or 3. In Formulae 1-1 and 1-2, b11 to b16 indicate the number of substituents, $R_{11}$ to $R_{16}$, respectively.

In an embodiment, the heterocyclic compound may be represented by one of Formulae 1-111 and 1-211:

1-111

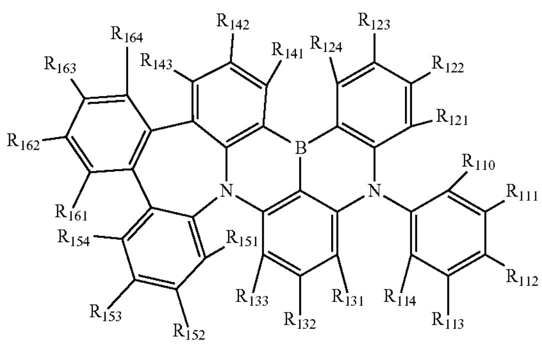

-continued 1-211

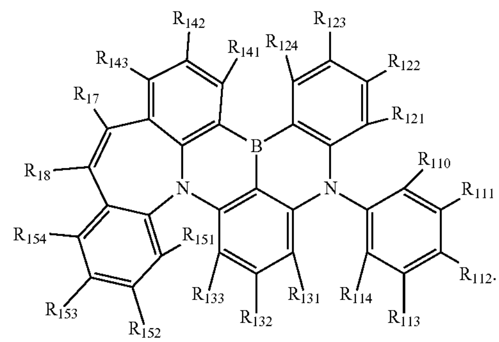

In Formulae 1-111 and 1-211, $R_{110}$ to $R_{114}$ may each independently be $X_{11}$, $Y_{11}$, or $R_{11}$, $R_{121}$ to $R_{124}$ may each independently be $X_{12}$, $Y_{12}$, or $R_{12}$, $R_{131}$ to $R_{133}$ may each independently be $X_{13}$, $Y_{13}$, or $R_{13}$, $R_{141}$ to $R_{143}$ may each independently be $X_{14}$, $Y_{14}$, or $R_{14}$, $R_{151}$ to $R_{154}$ may each independently be $X_{15}$, $Y_{15}$, or $R_{15}$, $R_{161}$ to $R_{164}$ may each independently be $X_{16}$, $Y_{16}$, or $R_{16}$, at least one of $R_{110}$ to $R_{114}$, $R_{121}$ to $R_{124}$, $R_{131}$ to $R_{133}$, $R_{141}$ to $R_{143}$, and $R_{151}$ to $R_{154}$ may be $X_{11}$, $X_{12}$, $X_{13}$, $X_{14}$, or $X_{15}$, at least two of $R_{110}$ to $R_{114}$, $R_{121}$ to $R_{124}$, $R_{131}$ to $R_{133}$, $R_{141}$ to $R_{143}$, and $R_{151}$ to $R_{154}$ may each independently be $X_{11}$, $X_{12}$, $X_{13}$, $X_{14}$, $X_{15}$, $Y_{11}$, $Y_{12}$, $Y_{13}$, $Y_{14}$, or $Y_{15}$, and $X_{11}$ to $X_{16}$, $Y_{11}$ to $Y_{16}$, and $R_{11}$ to $R_{18}$ may respectively be the same as described in connection with Formulae 1-1 and 1-2.

In one or more embodiments, the heterocyclic compound may be represented by one of Formulae 1-11 to 1-24 and 1-31 to 1-44:

1-11

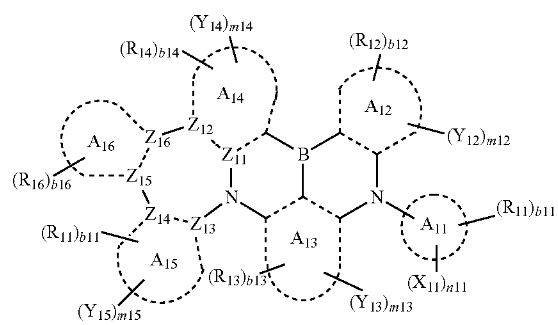

1-12

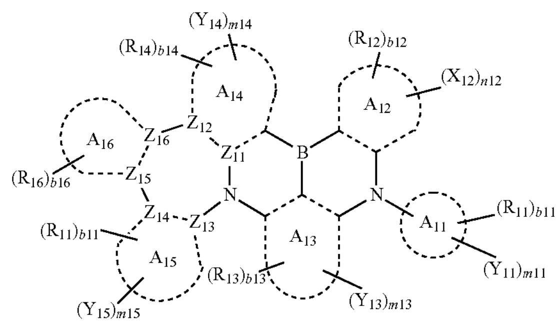

-continued
1-13
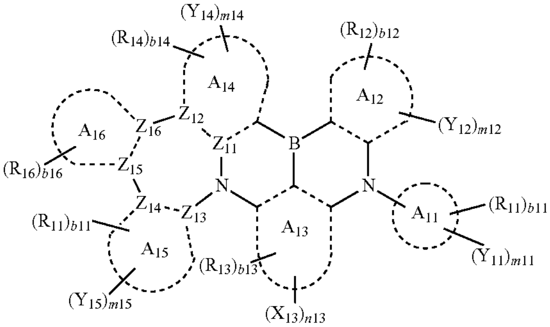
1-14
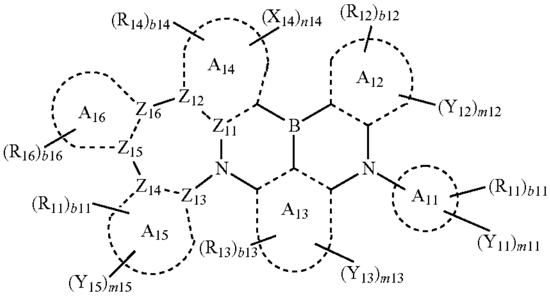
1-15
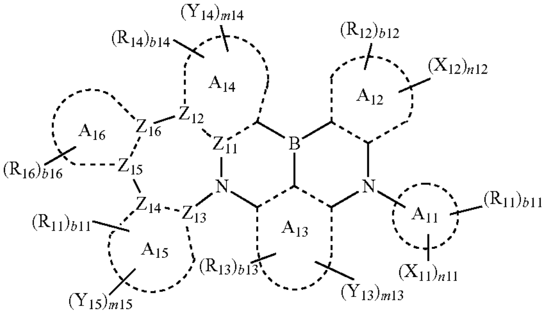
1-16
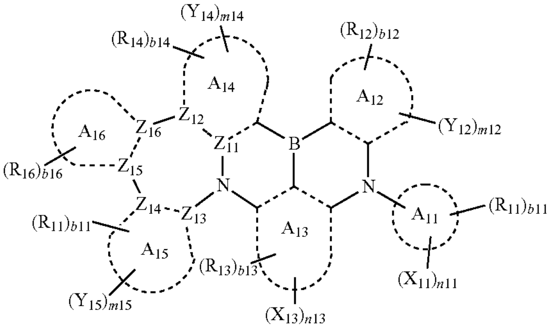
-continued
1-17
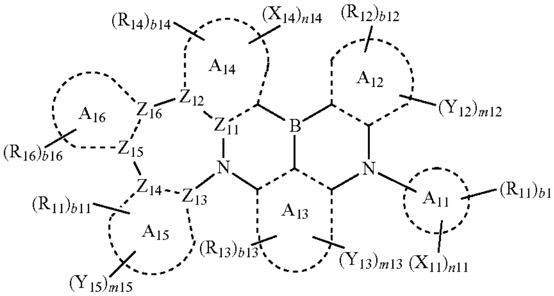
1-18
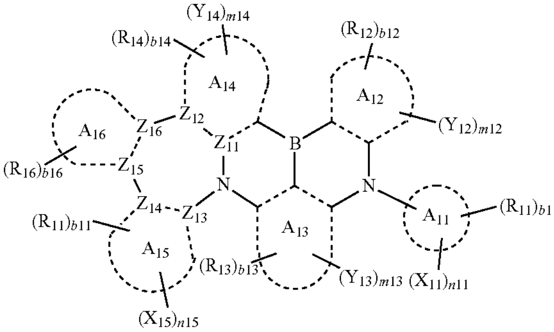
1-19
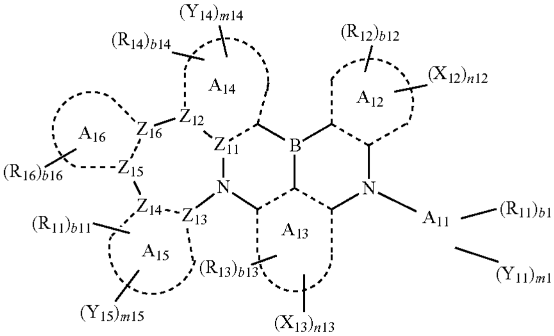
1-20
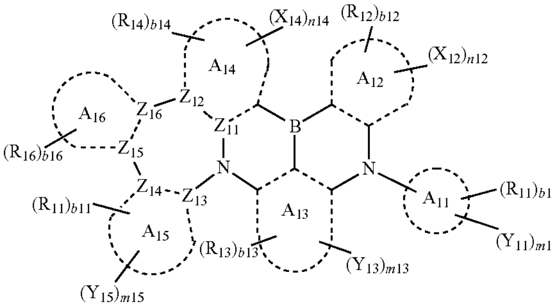

-continued
1-21
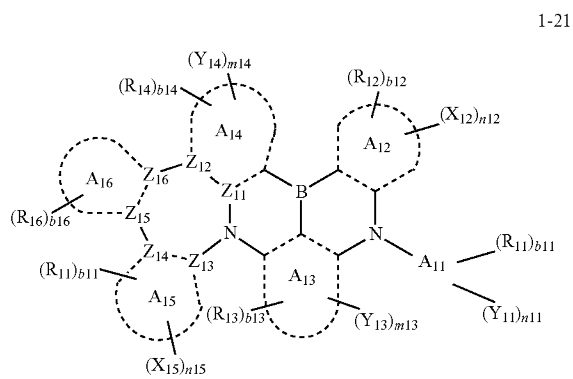
1-22
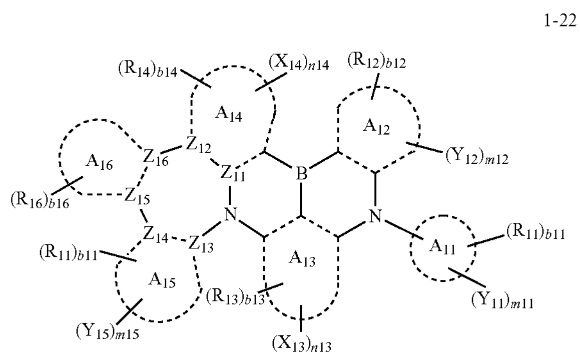
1-23
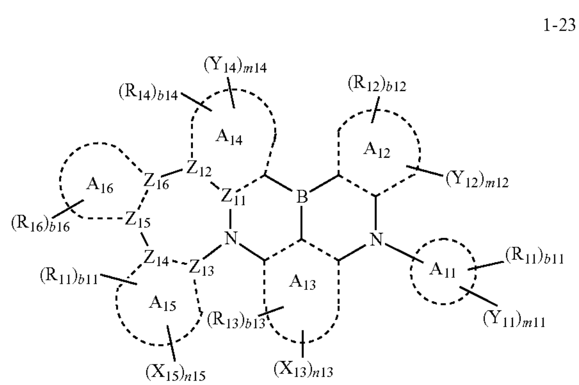
1-24
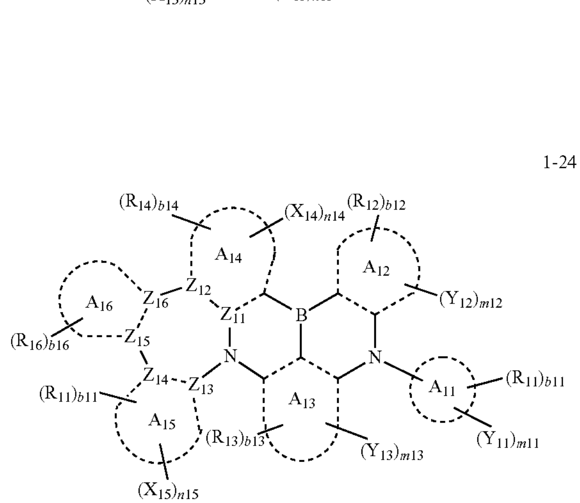
-continued
1-31
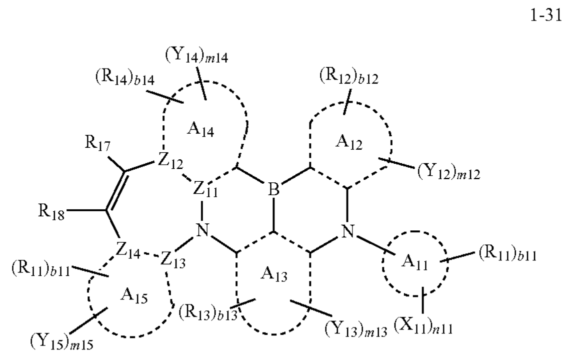
1-32
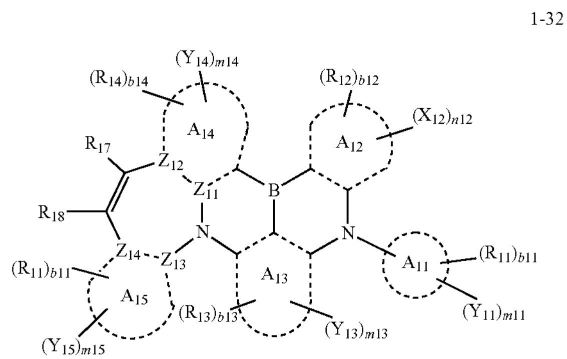
1-33
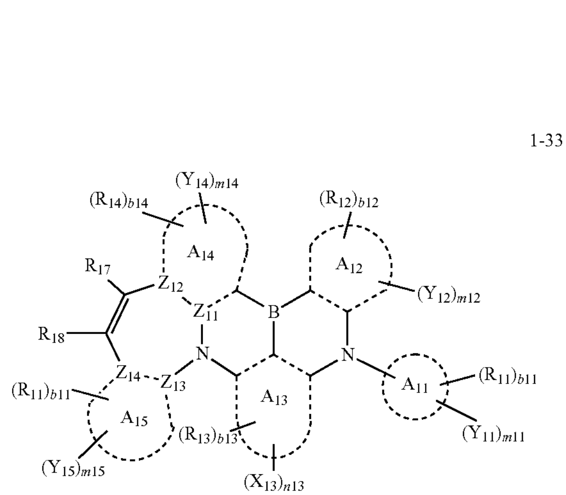
1-34
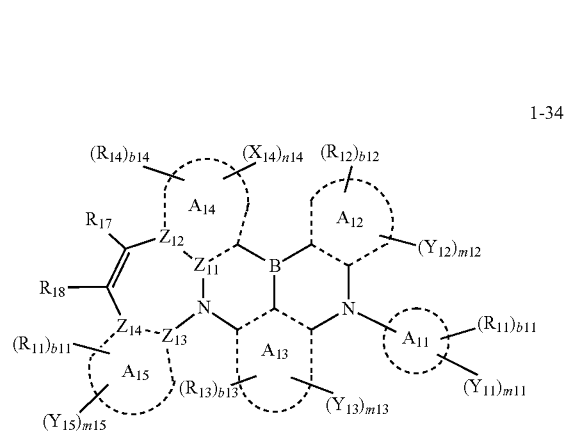

-continued
1-35
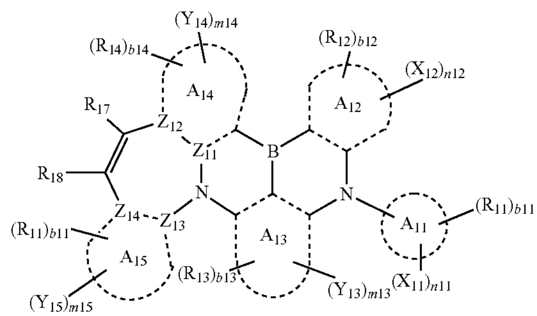
1-36
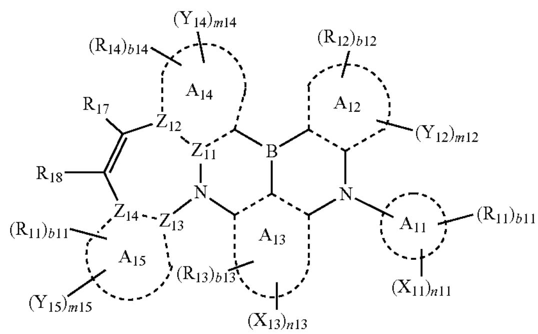
1-37
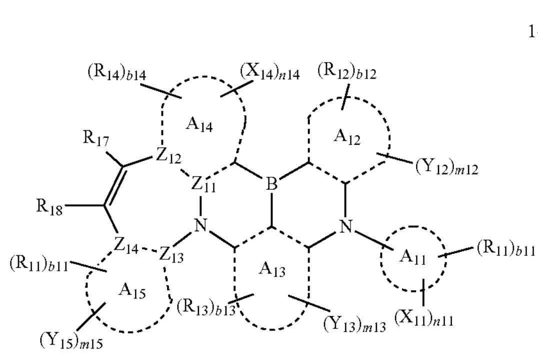
1-38
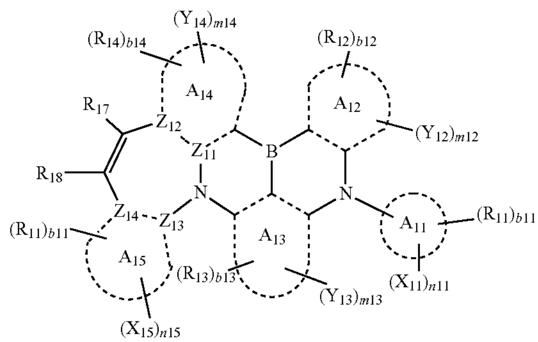
-continued
1-39
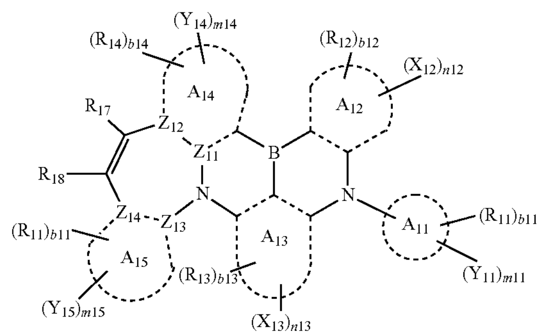
1-40
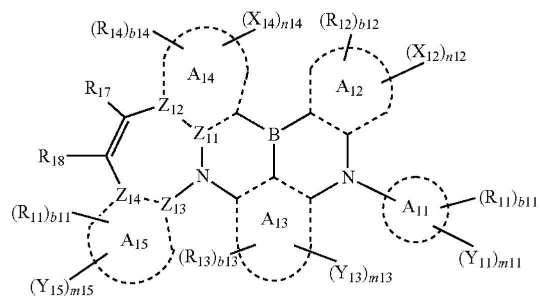
1-41
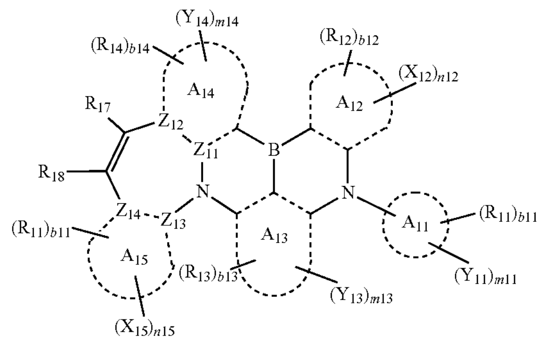
1-42
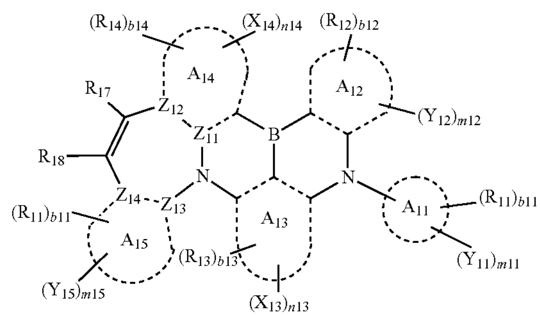

-continued 1-43

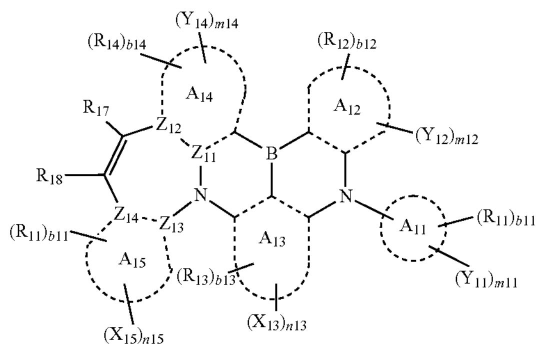

1-44

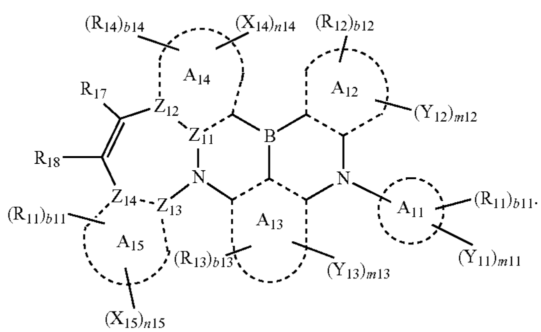

In Formulae 1-11 to 1-24 and 1-31 to 1-44, $A_{11}$ to $A_{16}$, $X_{11}$ to $X_{16}$, $Y_{11}$ to $Y_{16}$, $Z_{11}$ to $Z_{16}$, $R_{11}$ to $R_{18}$, and b11 to b16 may respectively be the same as described in connection with Formulae 1-1 and 1-2, n11 to n15 may each independently be 1 or 2, m11 to m15 may each independently be 0, 1, or 2, and the sum of n11 to n15 and m11 to m15 may be 2 or more.

For example, in Formulae 1-11 to 1-24 and 1-31 to 1-44, $A_{11}$ to $A_{16}$ may each independently be a benzene group.

For example, in Formulae 1-11 to 1-24 and 1-31 to 1-44, the sum of m11 to m15 may be 1 or more.

For example, in Formulae 1-11 to 1-24 and 1-31 to 1-44, m11 to m15 may each independently be 1 or 2.

For example, in Formulae 1-11 to 1-24 and 1-31 to 1-44, the sum of n11 to n15 and m11 to m15 may each independently be 4 or 5.

In one or more embodiments, the heterocyclic compound may be of Compounds 1 to 78:

1

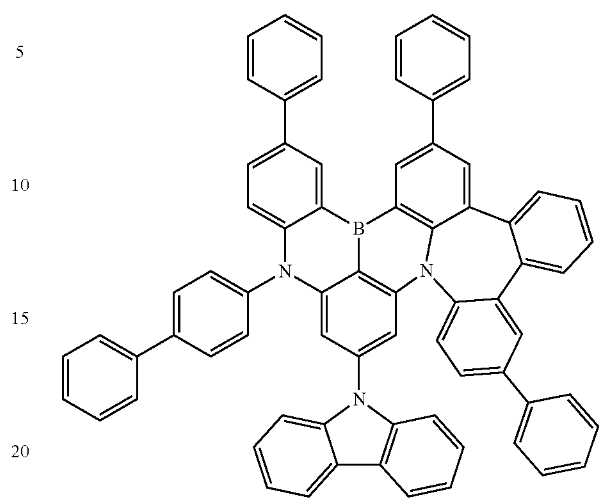

2

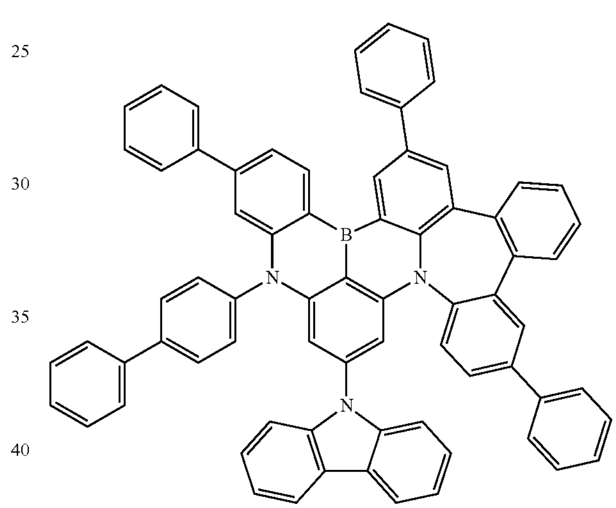

3

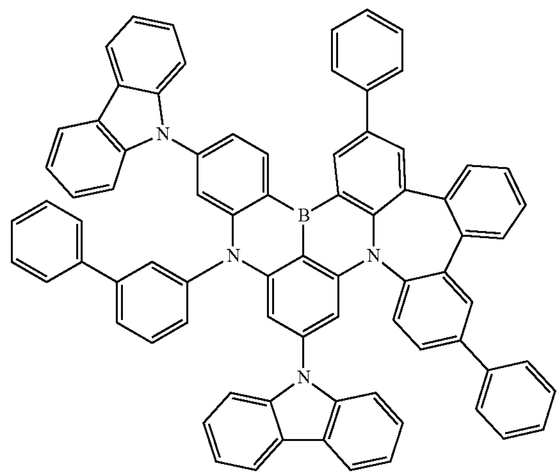

-continued
4
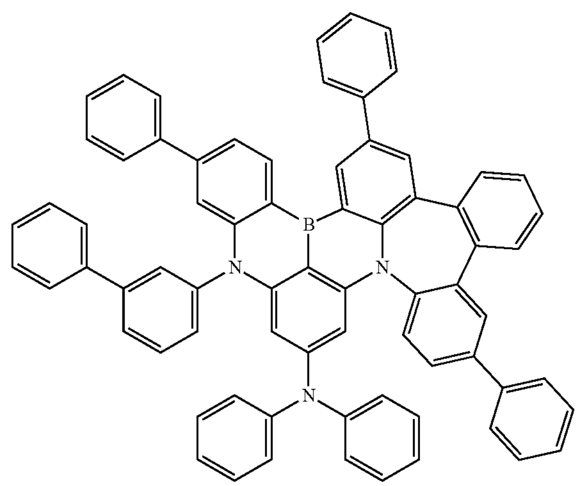
5
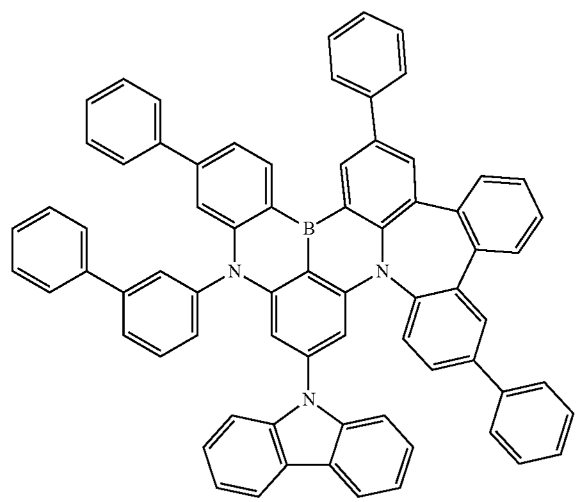
6
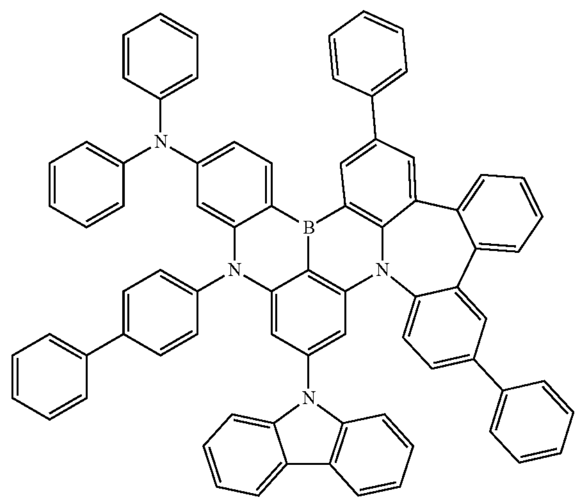
-continued
7
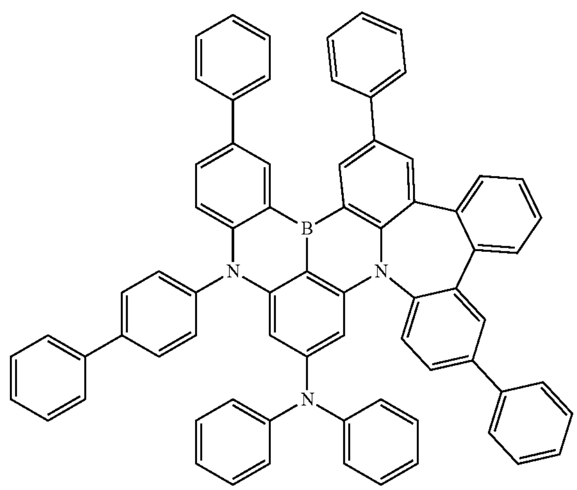
8
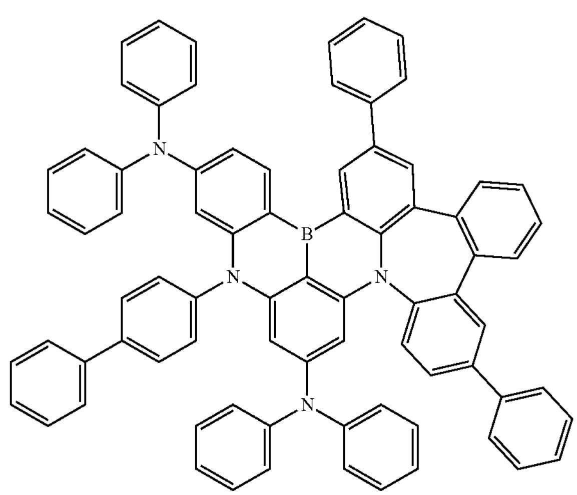
9
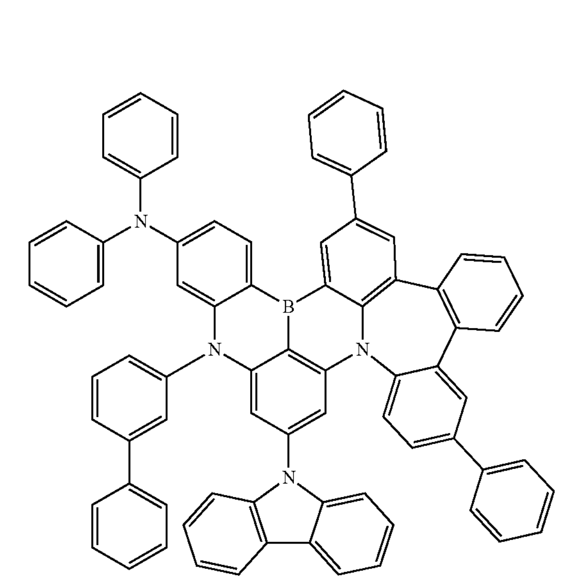

-continued
10
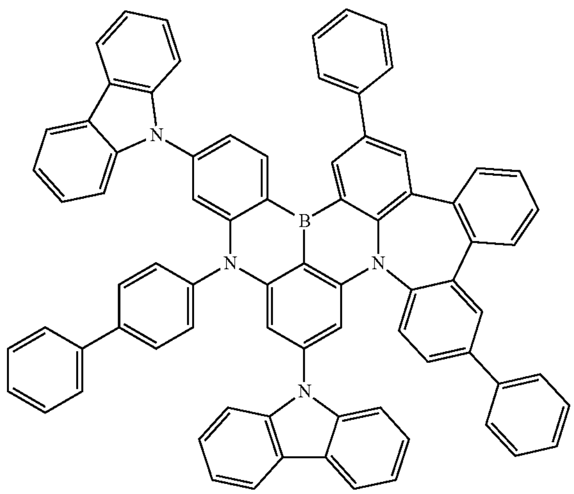
11
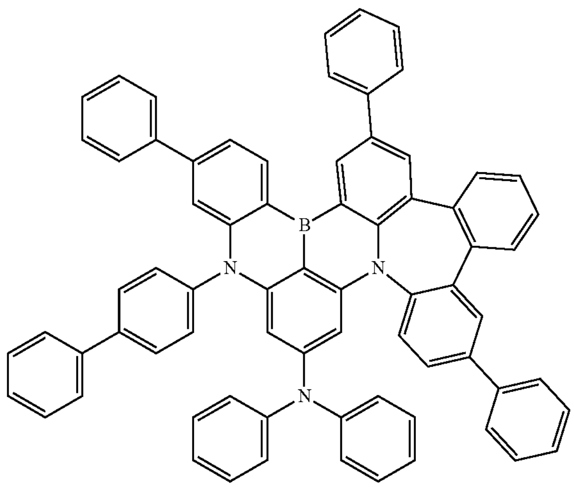
12
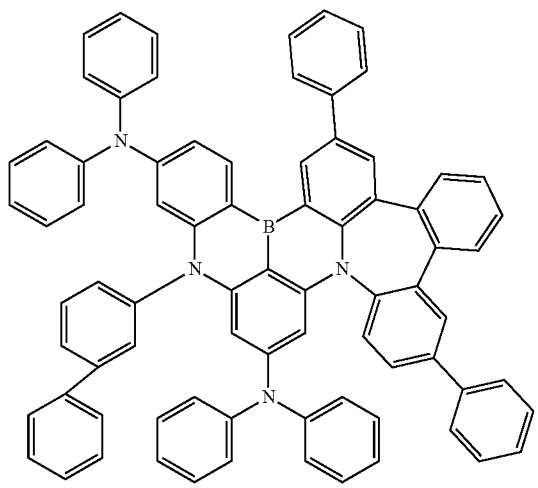
-continued
13
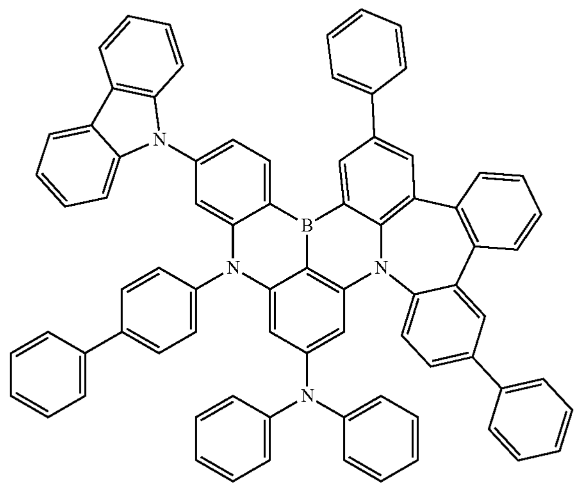
14
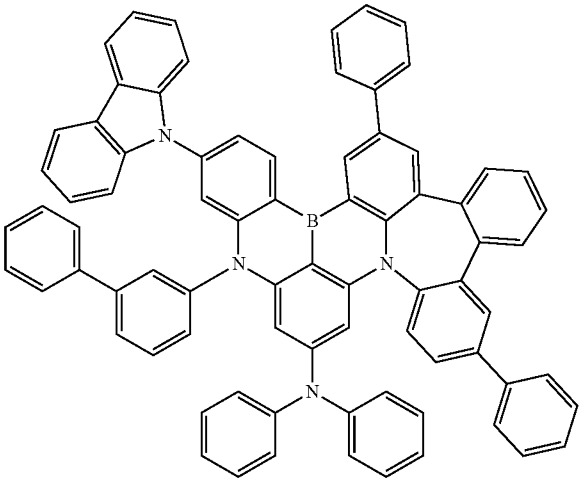
15
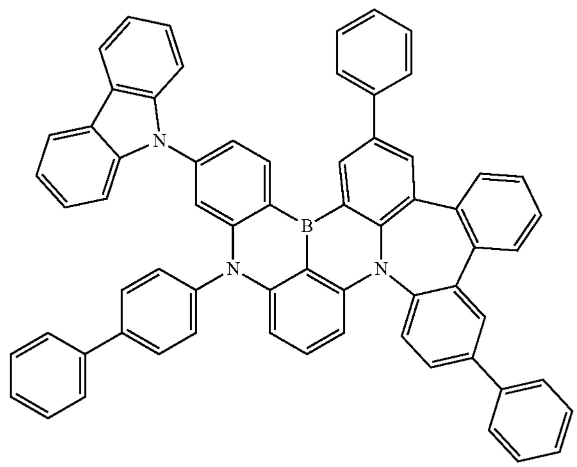

-continued
16
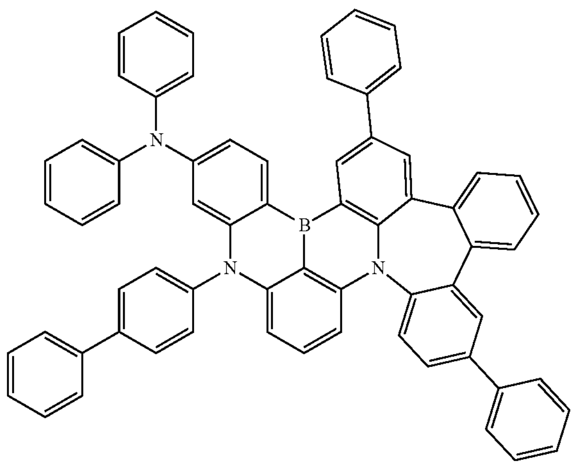
17
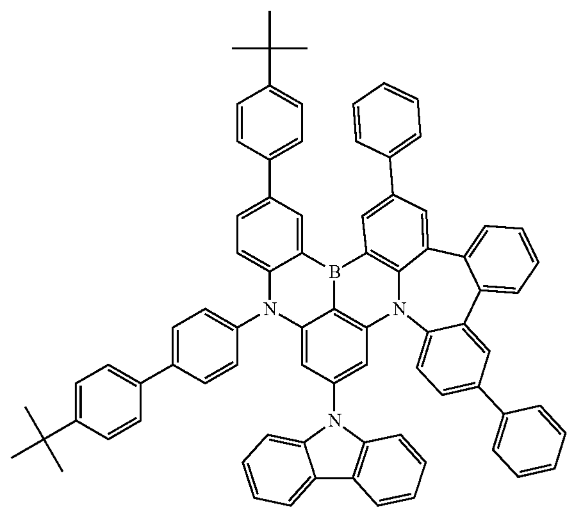
18
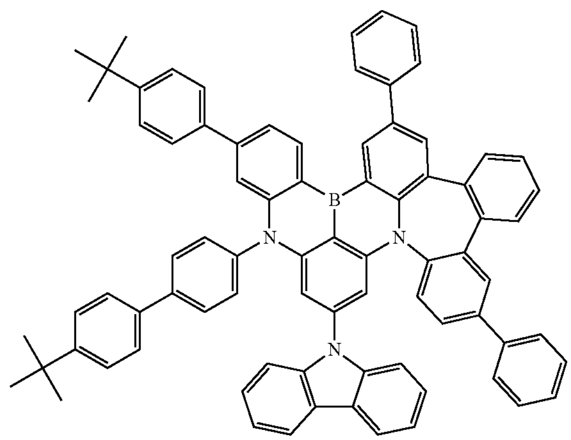
-continued
19
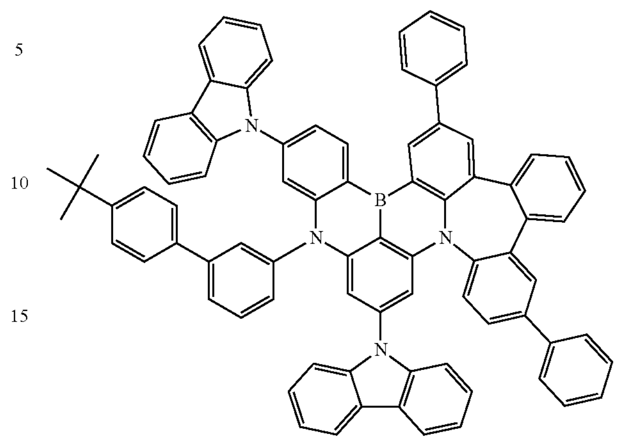
20
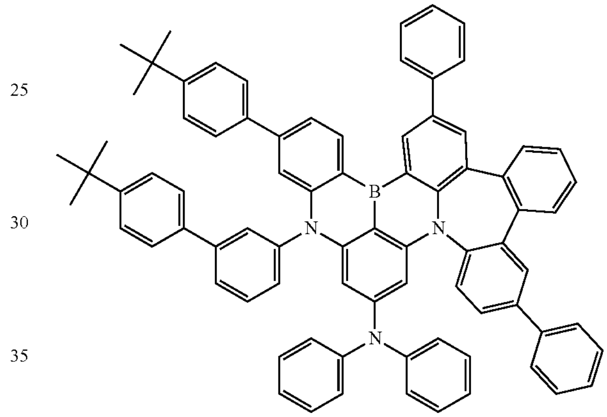
21
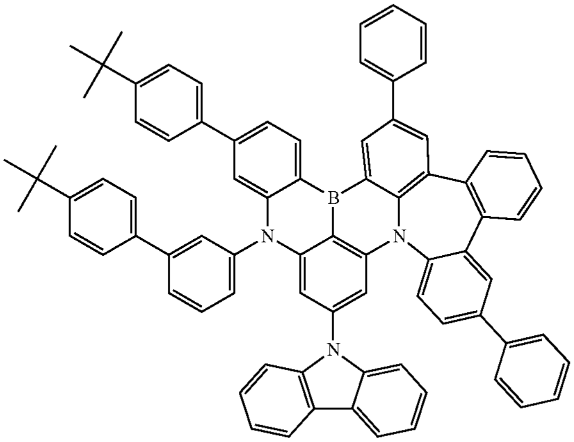

22
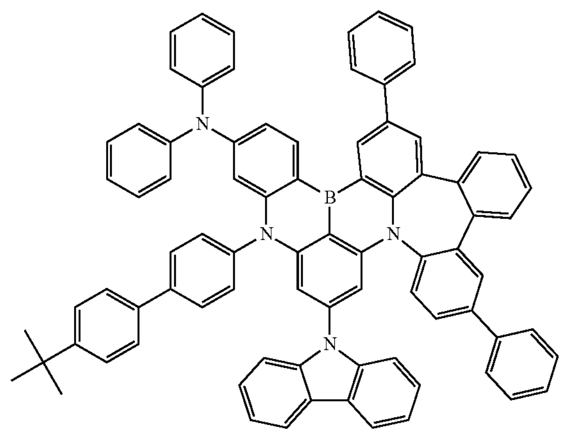
23
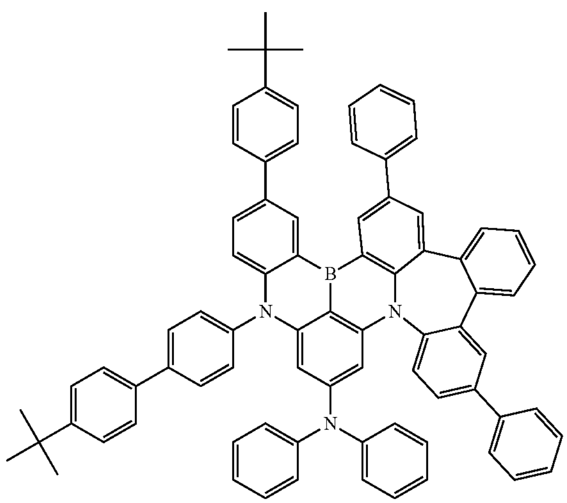
24
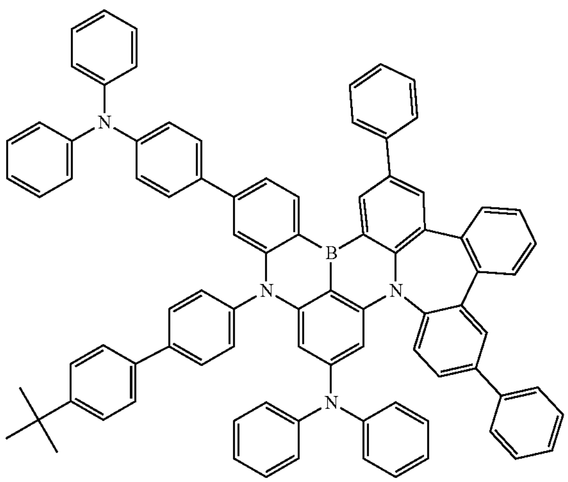
25
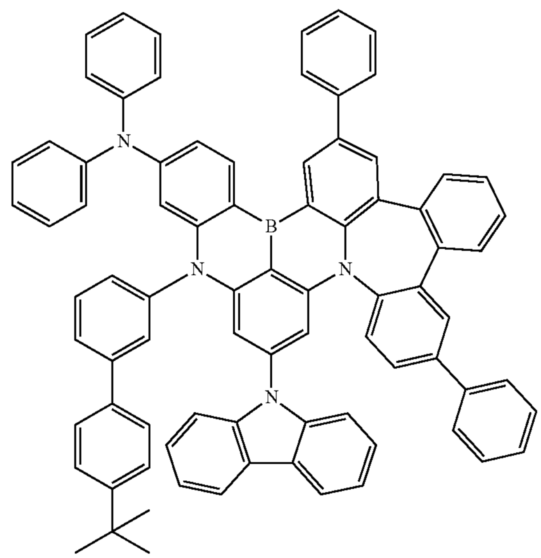
26
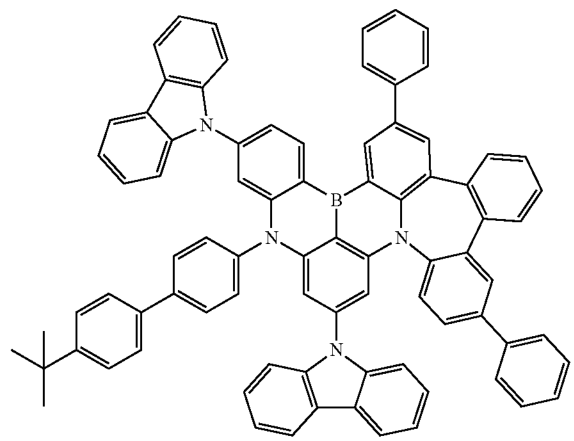
27
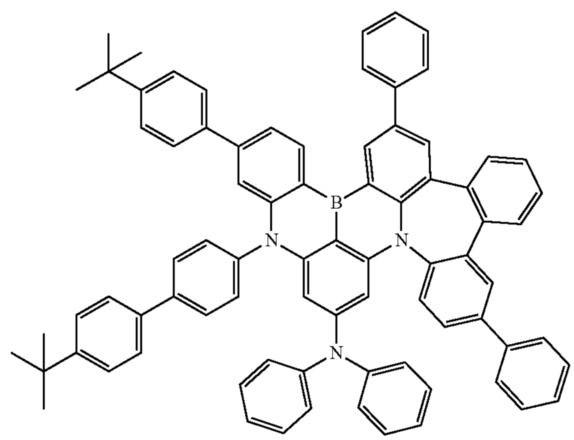

-continued
28
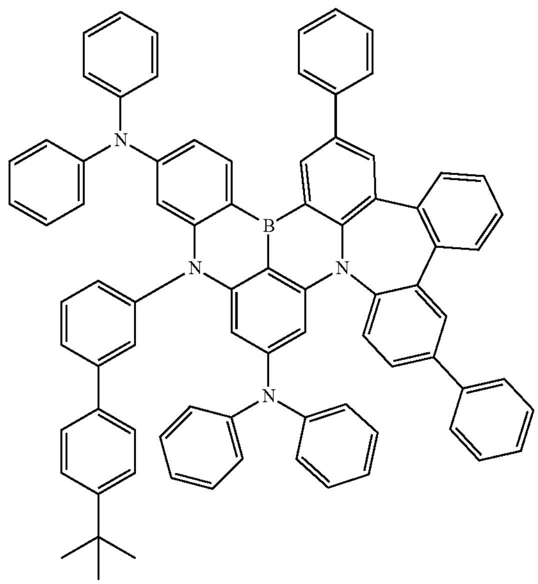
29
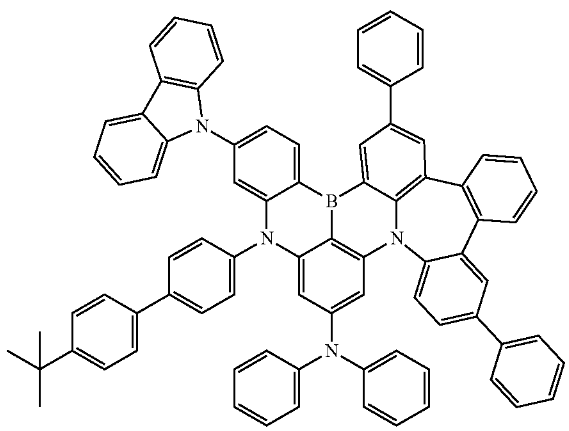
30
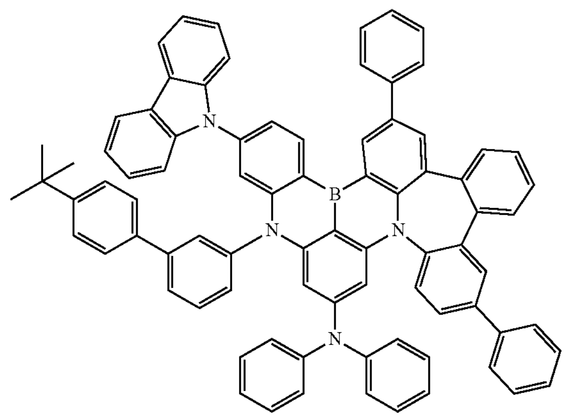
-continued
31
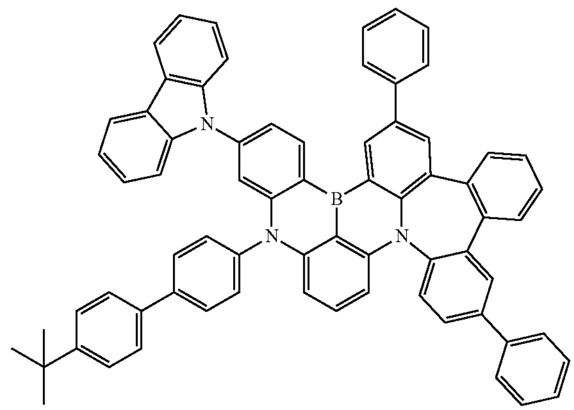
32
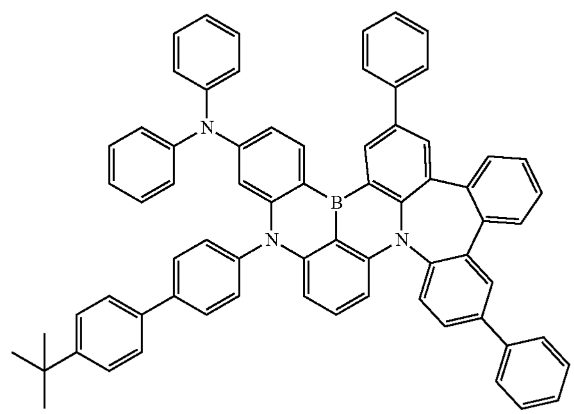
33
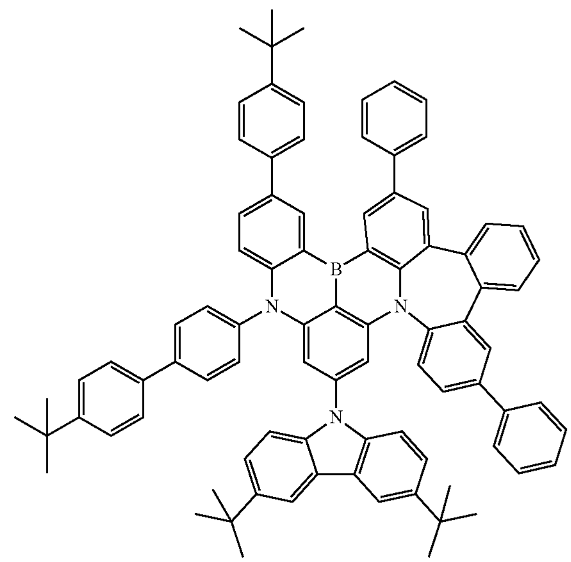

-continued
34
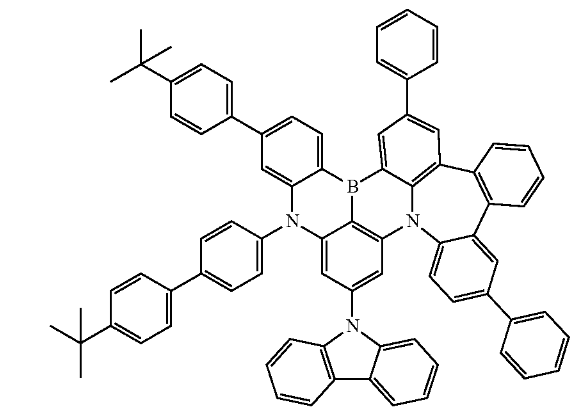
35
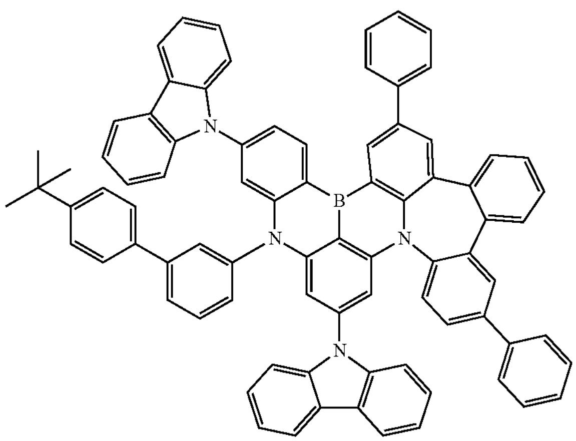
36
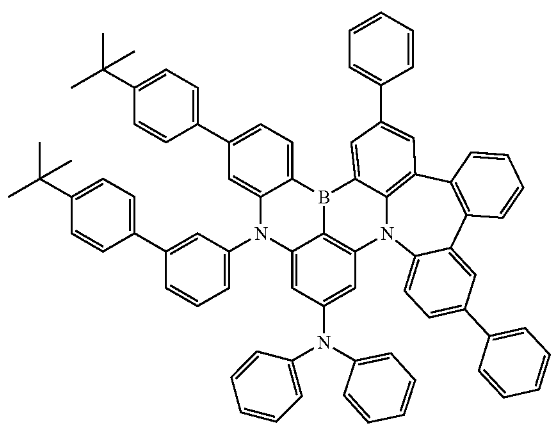
-continued
37
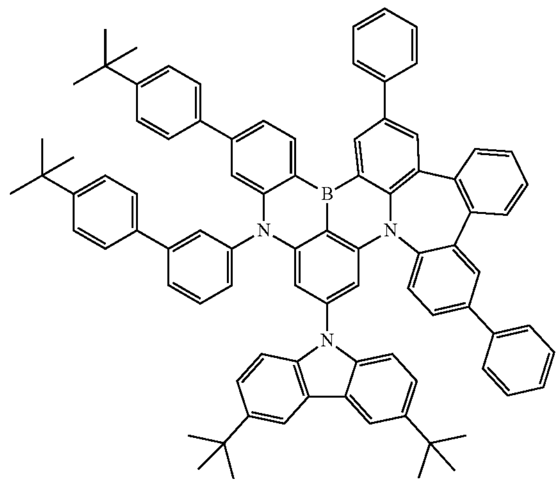
38
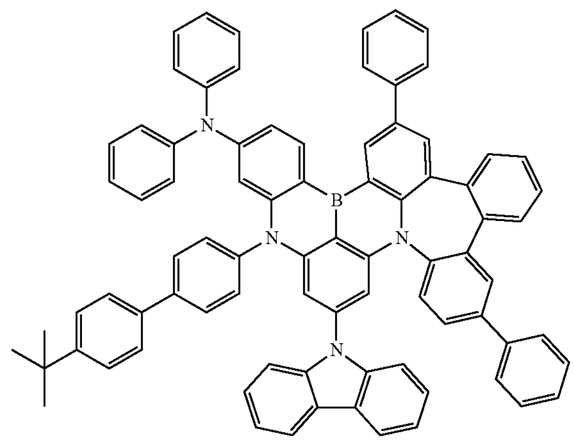
39
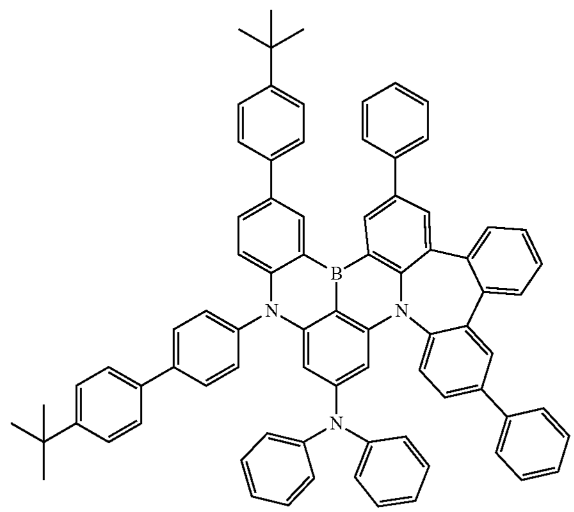

40
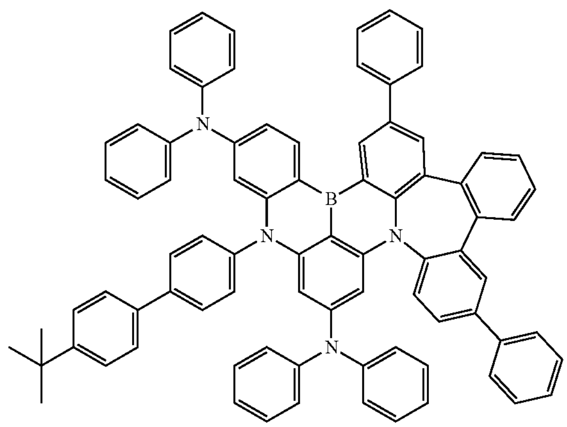
41
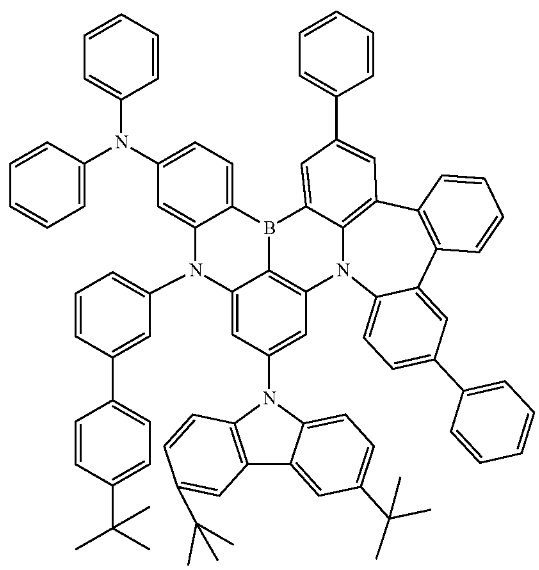
42
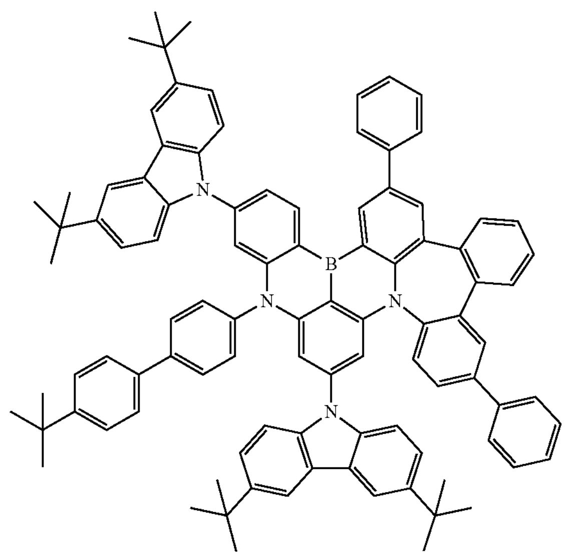
43
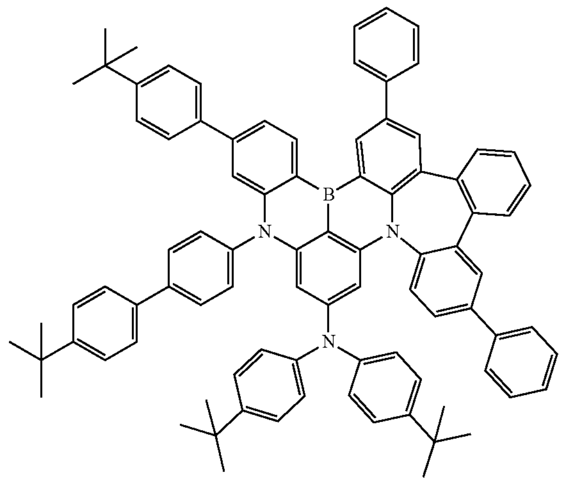
44
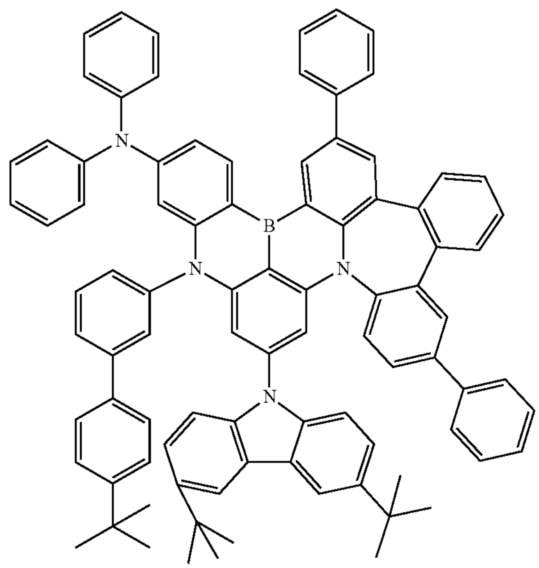
45
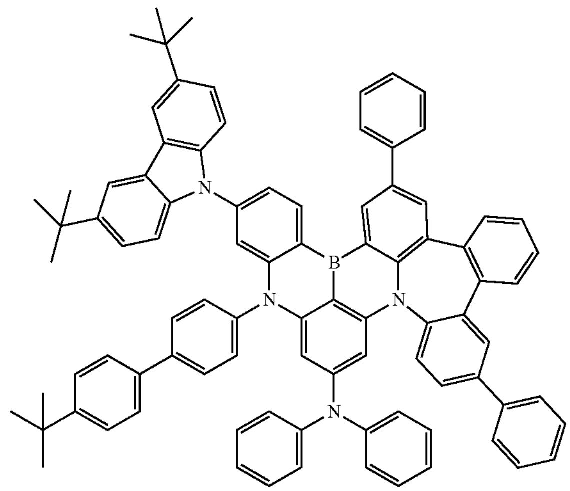

46
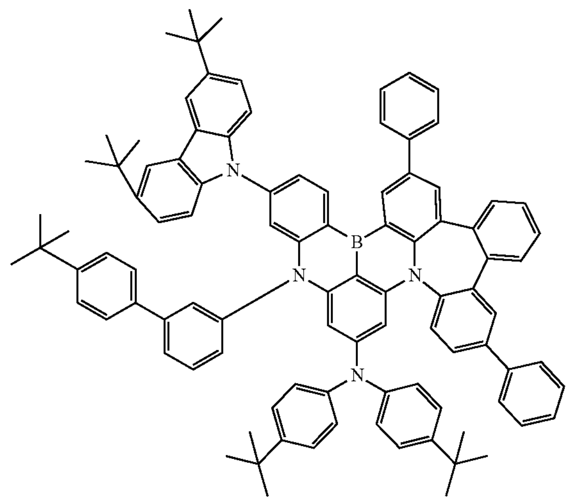
47
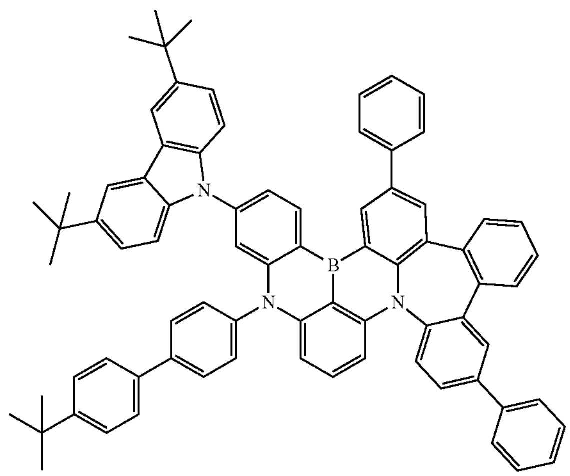
48
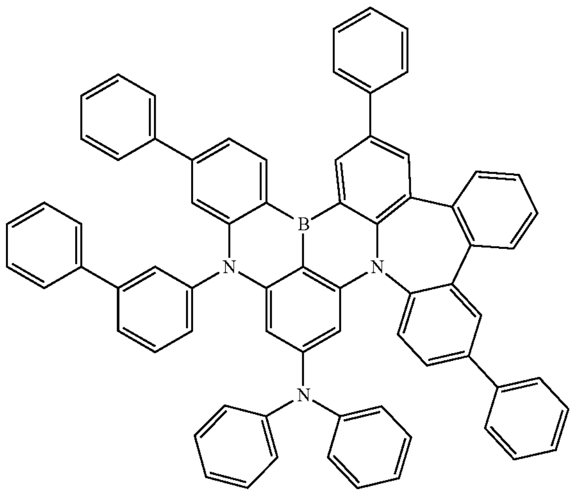
49
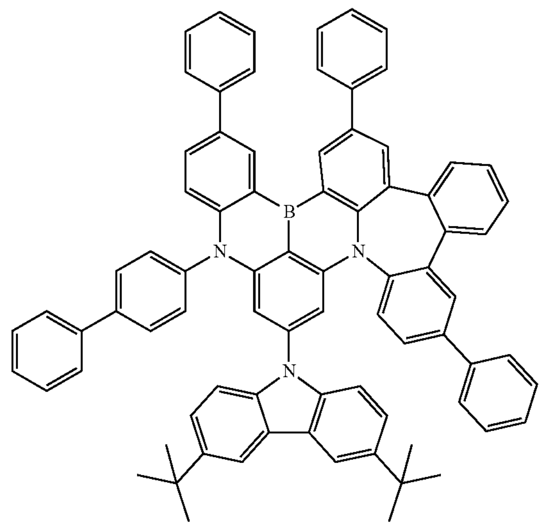
50
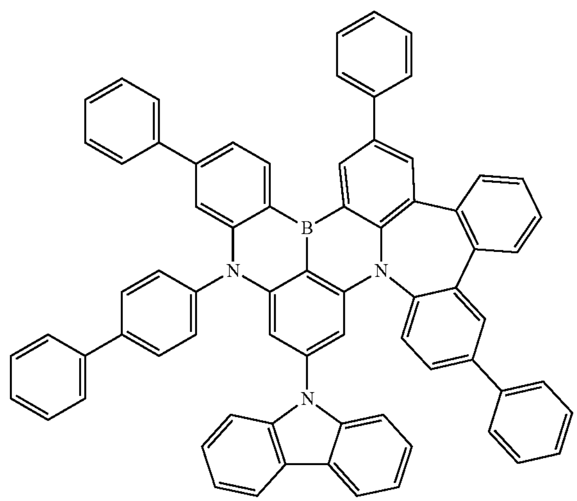
51
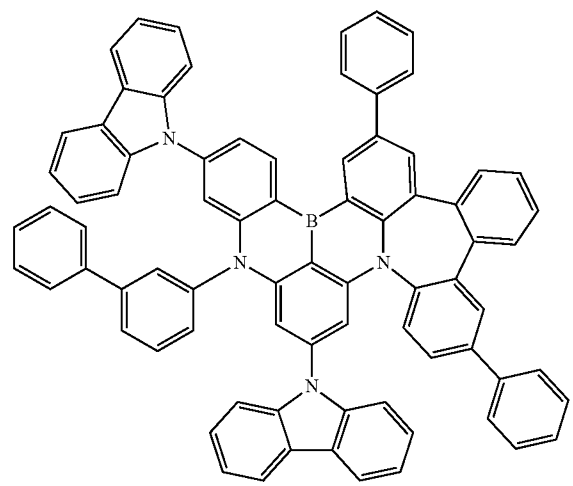

-continued
52
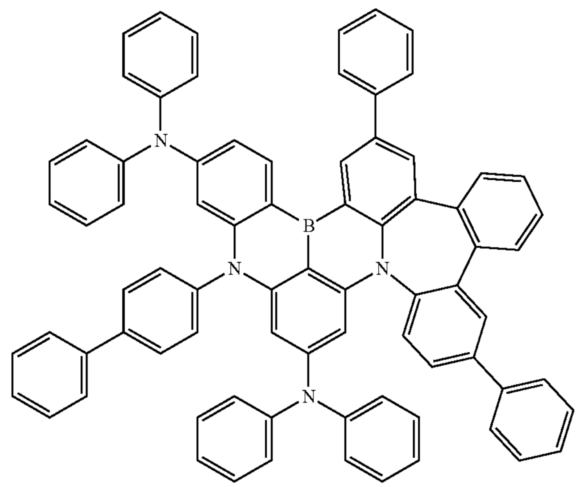
53
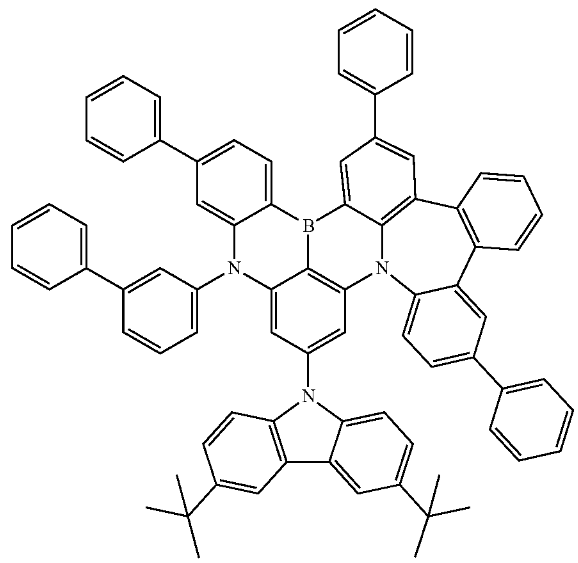
54
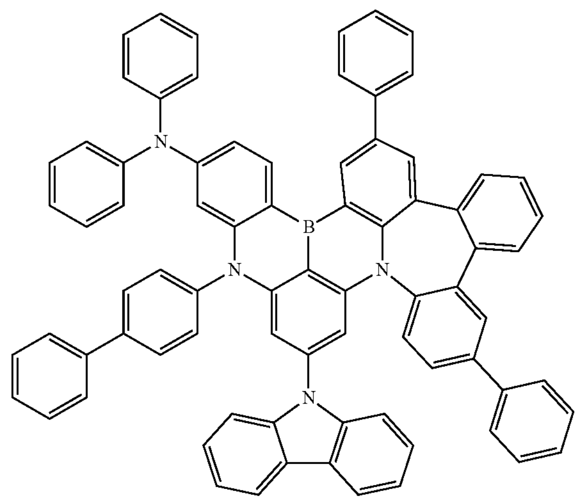
-continued
55
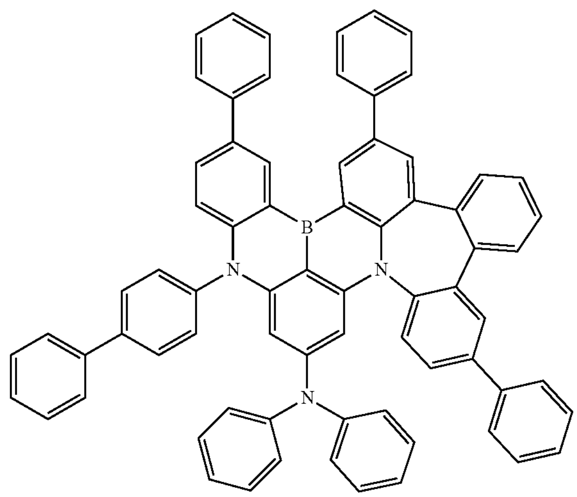
56
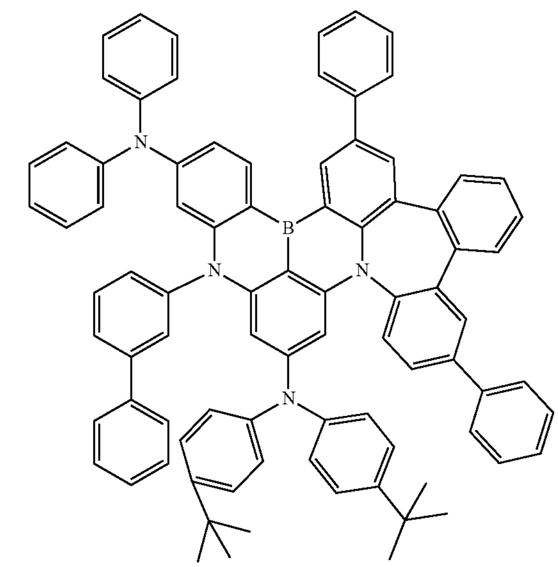

-continued
57
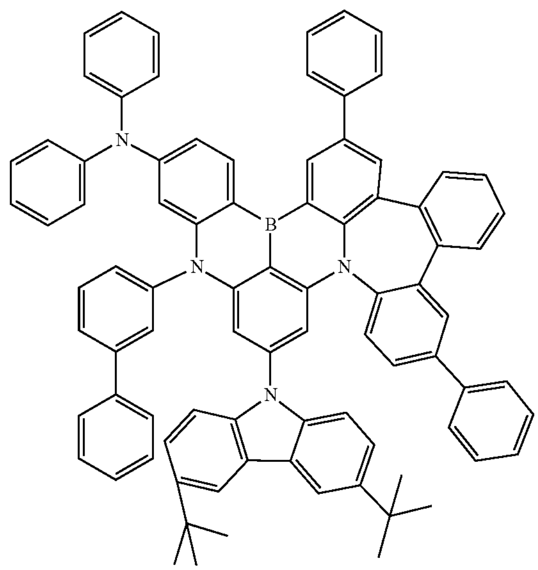
58
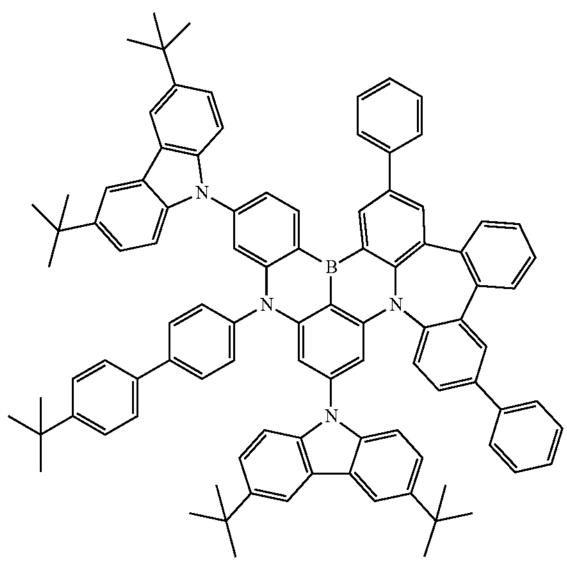
-continued
59
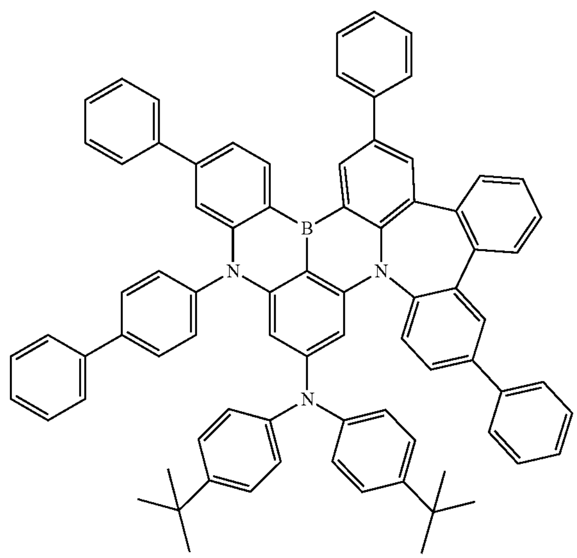
60
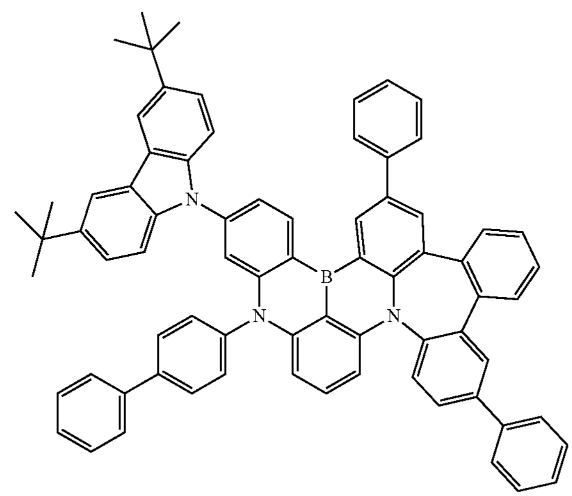
61
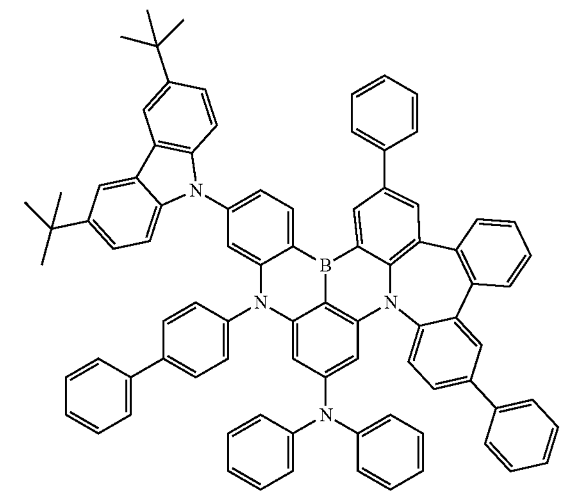

-continued
62
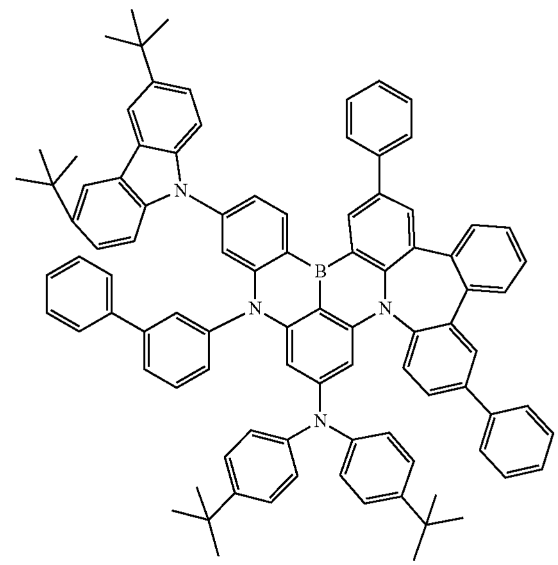
63
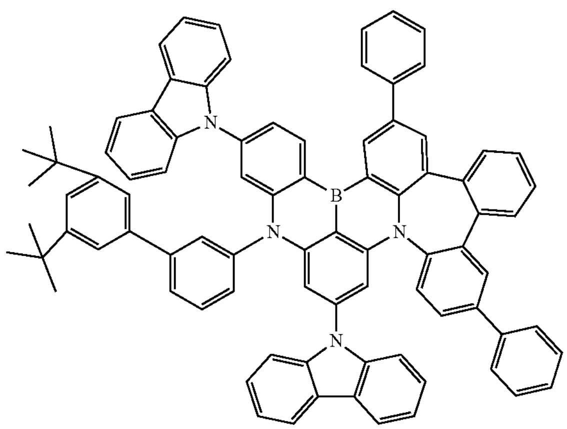
64
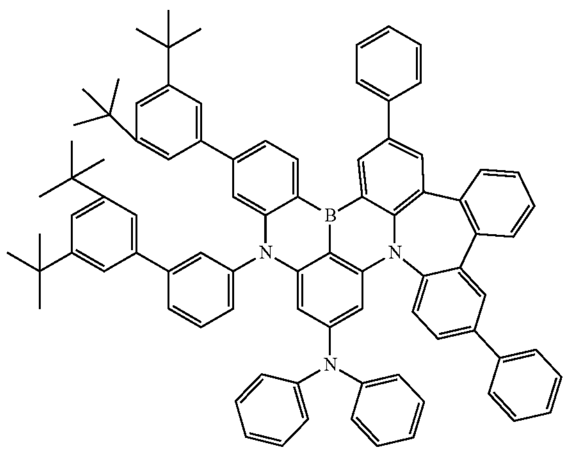
-continued
65
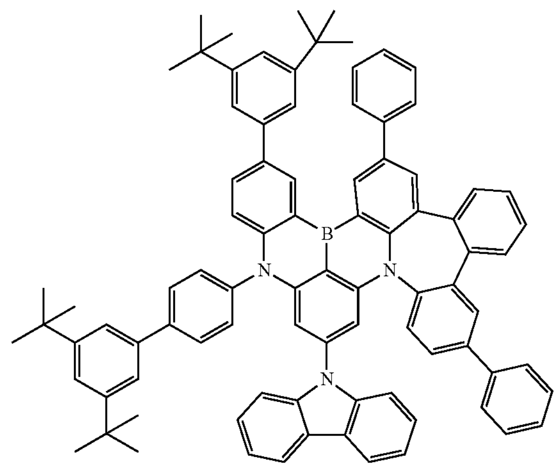
66
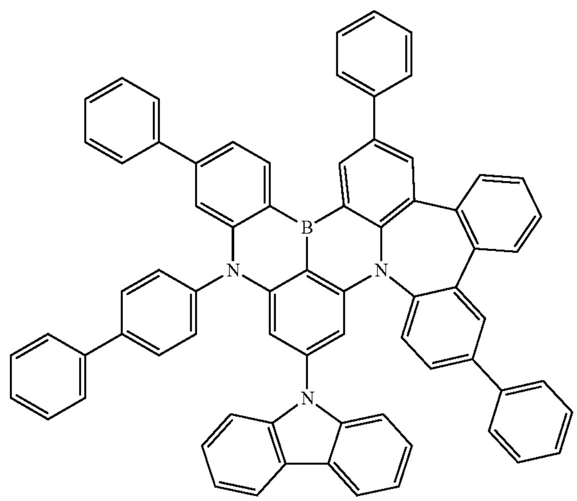
67
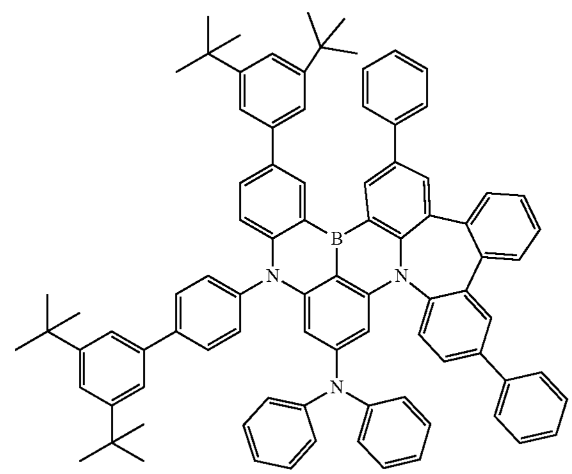

68
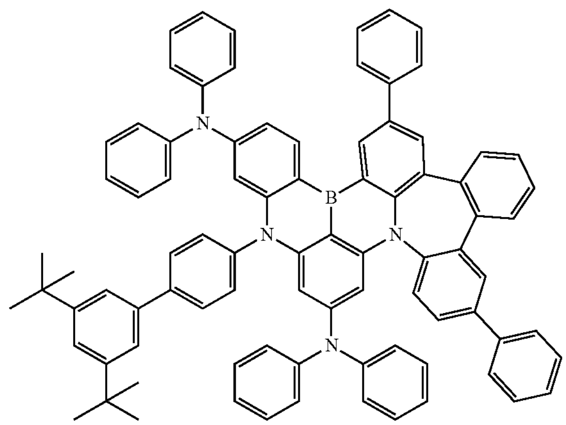
69
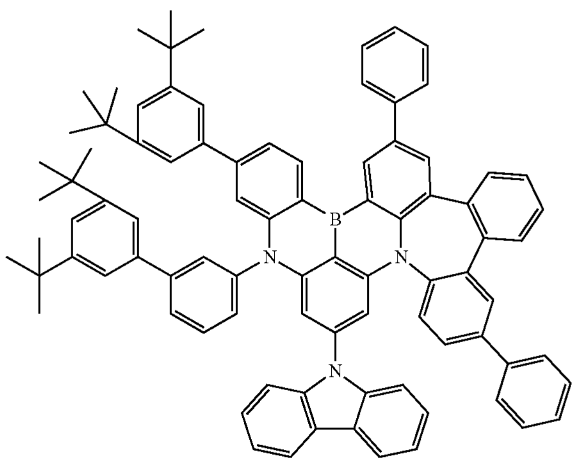
70
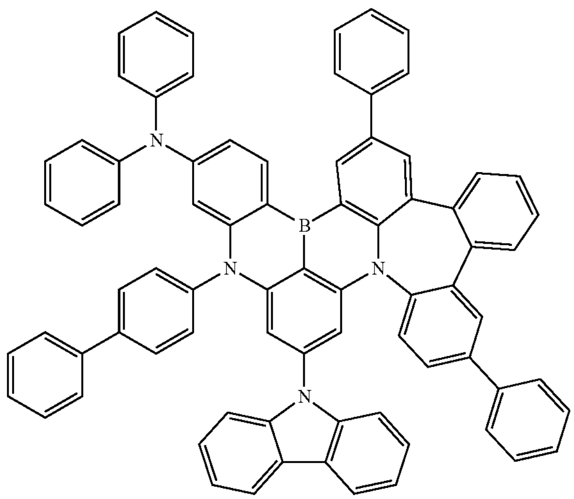
71
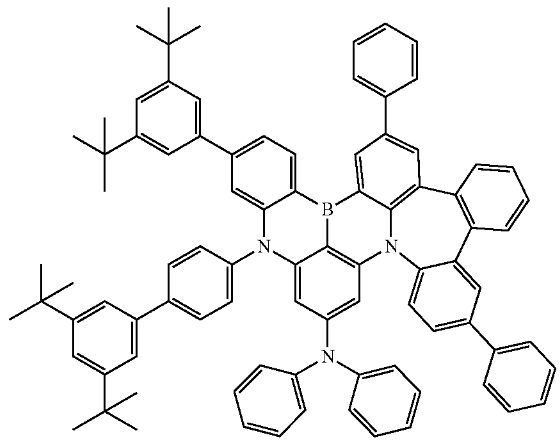
72
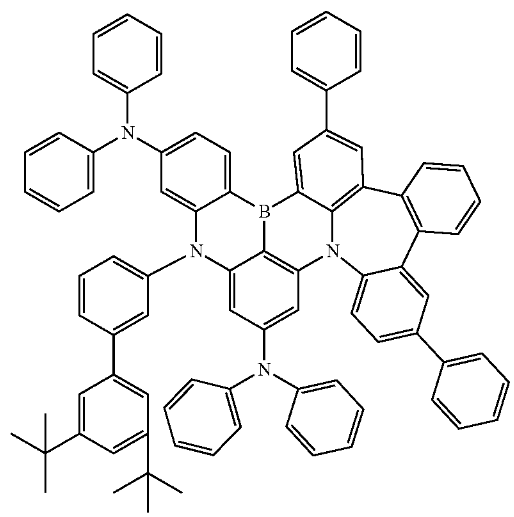
73
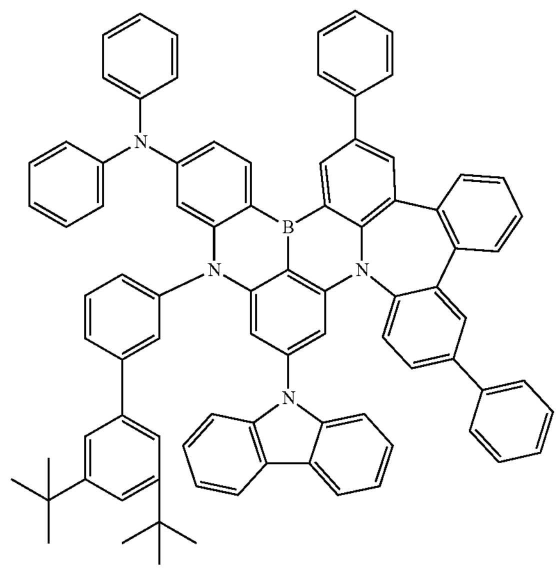

-continued

74

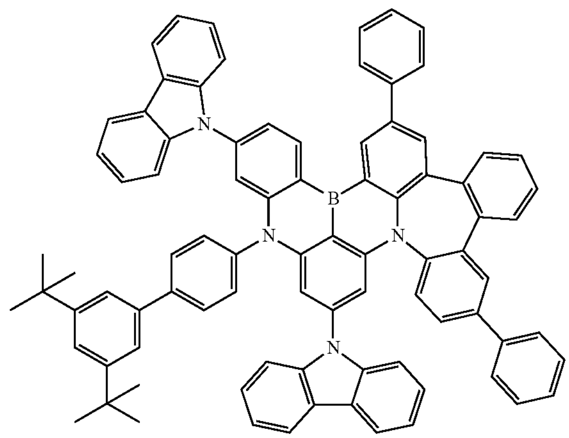

75

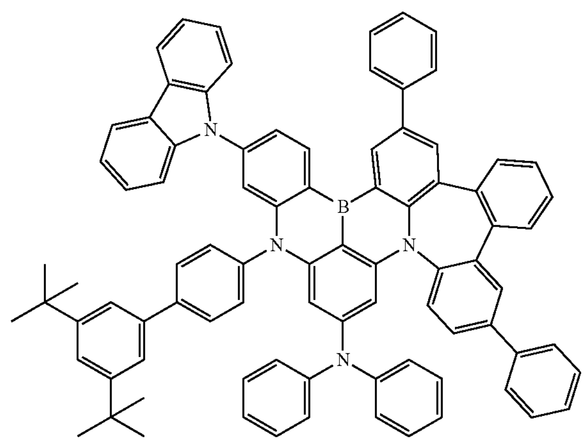

76

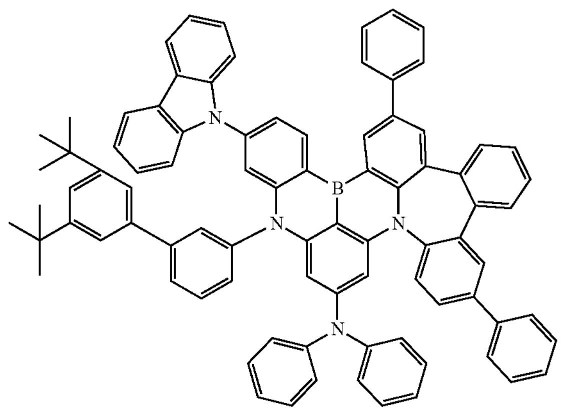

-continued

77

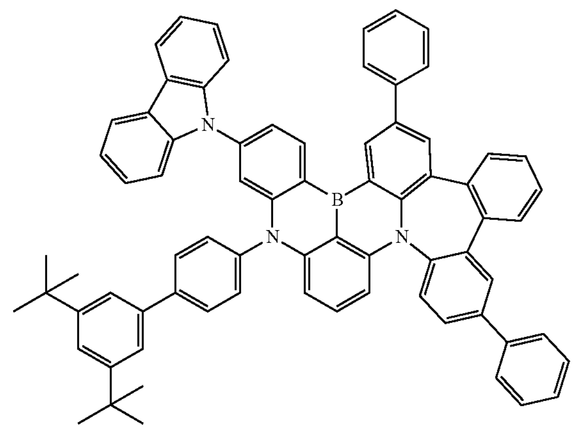

78

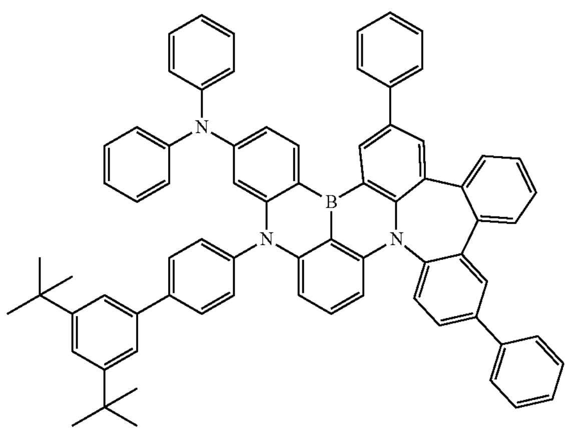

Since the heterocyclic compound has a rigid structure in which aromatic hydrocarbon rings or heteroaromatic rings are condensed with each other, structural relaxation in an excited state may be suppressed. As a result, the heterocyclic compound may have a narrow width of blue emission spectrum and exhibit improved color purity.

In detail, since the heterocyclic compound includes an N atom in a moiety structure represented by

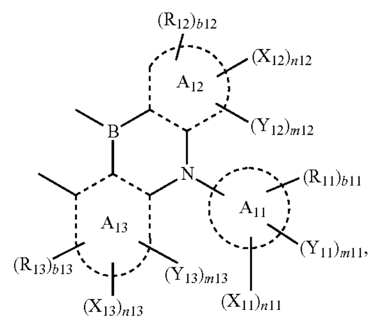

then the heterocyclic compound may have a relatively narrow full width at half maximum (FWHM), and more specifically, may have a narrower FWHM than that of a heterocyclic compound including an O atom or an S atom. For example, it is known that a FWHM of each of TMCz-BO and TMCz-3P that include an O atom or an S atom is 59 nm and 61 nm, respectively (J. U. Kim, I. S. Park, C.-Y. Chan, M. Tanaka, Y. Tsuchiya, H. Nakanotani, C. *Adachi, Nat. Commun.* 2020, 11, 1765), but a FWHM of TBN-TPA including an N atom with relatively low structural fluidity is 27 nm (X. Liang, Z.-P. Yan, H.-B. Han, Z.-G. Wu, Y.-X. Zheng, H. Meng, J.-L. Zuo, W. *Huang, Angew. Chem., Int. Ed.* 2018, 57, 11316).

In addition, in the heterocyclic compound of the present disclosure, the sum of n11 to n16 in Formula 1-1 may be 1 or more, and the sum of n11 to n15 in Formula 1-2 may be 1 or more. In this regard, the heterocyclic compound may have improved luminescence efficiency, and as compared to a compound including an alkylamino group or the like, the heterocyclic compound has a substituent in which an aryl group is substituted for N so that the compound stability may be improved. Accordingly, an organic light-emitting device including the heterocyclic compound may have improved efficiency and/or a long lifespan.

In the heterocyclic compound, the sum of n11 to n16 and m11 to m16 in Formula 1-1 may each be 2 or more, and the sum of n11 to n15 and m11 to m15 in Formula 1-2 may each be 2 or more. In this regard, due to the extended conjugated bonds in the heterocyclic compound, stabilization of the heterocyclic compound may be achieved. Accordingly, an organic light-emitting device including the heterocyclic compound may have improved efficiency and/or a long lifespan.

In addition, since the heterocyclic compound has an asymmetric structure in its core, a dense wavelength control may be possible along with shortening of an emission wavelength, thereby providing an organic light emitting device with high efficiency and/or a long life.

A peak wavelength in photoluminescence (PL) of the heterocyclic compound according to an embodiment is not particularly limited, but may be about 430 nm or more. In one or more embodiments, the peak wavelength may be about 435 nm or more, about 440 nm or more, about 500 nm or less, about 490 nm or less, or about 480 nm or less. When the peak wavelength is within these ranges, the heterocyclic compound according to an embodiment may be particularly suitable for emission of blue light.

The heterocyclic compound according to an embodiment may have a small FWHM value of an emission intensity of a peak having the PL peak wavelength above. In detail, the heterocyclic compound may have a FWHM value of about 45 nm or less, about 40 nm or less, or about 35 nm or less. When the FWHM is within these ranges, the heterocyclic compound according to an embodiment may have further improved color purity.

The peak wavelength and the FWHM in the PL may each be measured and/or calculated using a spectrofluorophotometer.

A highest occupied molecular orbital (HOMO) energy level, a lowest unoccupied molecular orbital (LUMO) energy level, an $S_1$ energy level, and a $T_1$ energy level of some compounds of the heterocyclic compound represented by Formula 1-1 or 1-2 are evaluated using the Gaussian 09 program with the molecular structure optimization obtained by B3LYP-based density functional theory (DFT), and results thereof are shown in Table 1.

TABLE 1

| Compound No. | HOMO (eV) | LUMO (eV) | $S_1$ (eV) | $T_1$ (eV) |
|---|---|---|---|---|
| 1 | −5.04 | −1.57 | 2.99 | 2.58 |
| 6 | −4.96 | −1.49 | 3.00 | 2.62 |

TABLE 1-continued

| Compound No. | HOMO (eV) | LUMO (eV) | $S_1$ (eV) | $T_1$ (eV) |
|---|---|---|---|---|
| 8 | −4.81 | −1.34 | 3.00 | 2.65 |
| 10 | −5.15 | −1.68 | 3.00 | 2.61 |
| 13 | −5.00 | −1.51 | 3.01 | 2.65 |

1

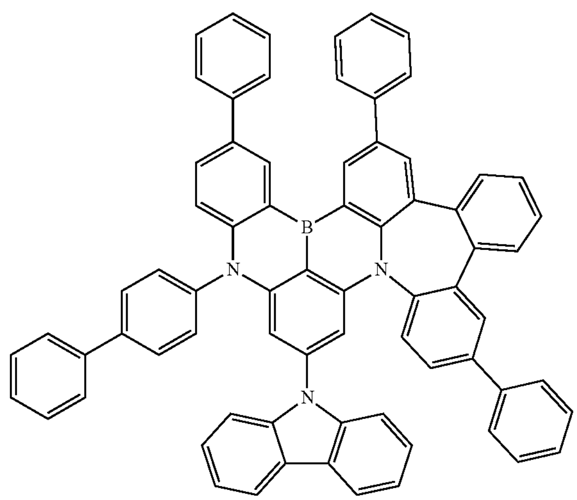

6

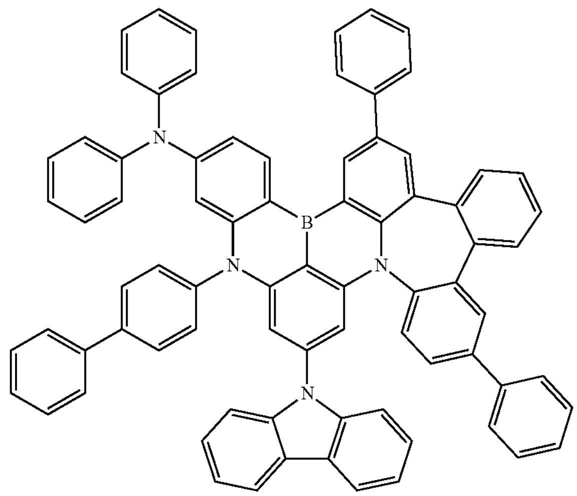

-continued

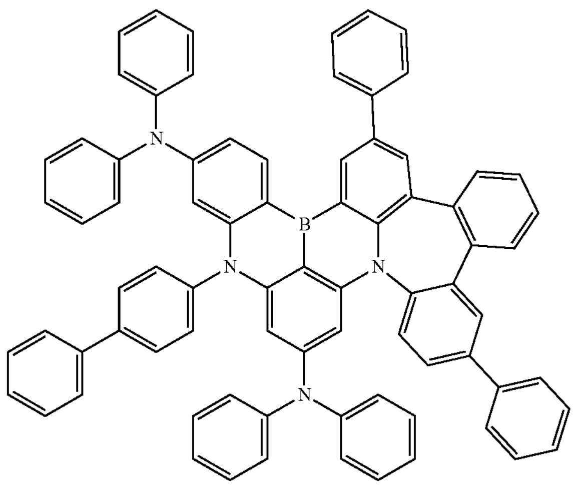

8

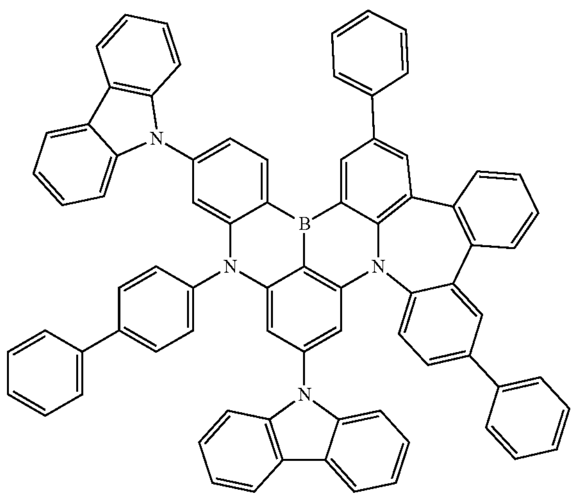

10

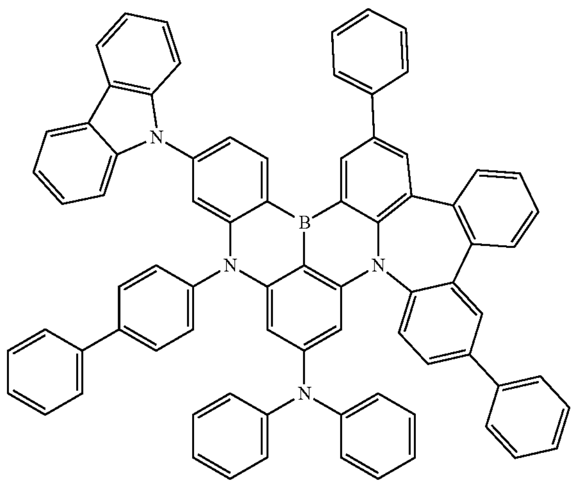

13

Referring to Table 1, it is confirmed that the heterocyclic compound represented by Formula 1-1 or 1-2 has electric characteristics suitable for use as a dopant in an emission layer of an electronic device, for example, an organic light-emitting device.

Synthesis methods of the heterocyclic compound according to an embodiment is not particularly limited, and the heterocyclic compound may be synthesized according to a known synthesis method. In particular, the heterocyclic compound may be synthesized according to or in view of methods described in Examples below. For example, in the methods described in Examples below, the heterocyclic compound according to an embodiment may be synthesized through modifications such as changing raw materials and reaction conditions, adding or excluding some processes, or appropriately combining with other known synthesis methods.

A method of identifying a structure of the heterocyclic compound according to an embodiment is not particularly limited. The heterocyclic compound including nitrogen according to an embodiment may be identified by a known method (for example, NMR, LC-MS, or the like).

Description of FIG. 1

FIG. 1 is a schematic view of an organic light-emitting device 10 according to an exemplary embodiment. Hereinafter, a structure and a manufacturing method of an organic light-emitting device according to an example of the present disclosure will be described with reference to FIG. 1.

The organic light-emitting device 10 of FIG. 1 includes a first electrode 11, a second electrode 19 facing the first electrode 11, and an organic layer 10A between the first electrode 11 and the second electrode 19.

The organic layer 10A may include an emission layer 15, a hole transport region 12 may be arranged between the first electrode 11 and the emission layer 15, and an electron transport region 17 may be arranged between the emission layer 15 and the second electrodes 19.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

[First Electrode 11]

The first electrode 11 may be, for example, formed by depositing or sputtering a material for forming the first electrode 11 on the substrate. The first electrode 11 may be an anode. The material for forming the first electrode 11 may be a material with a high work function to facilitate hole injection.

The first electrode 11 may be a reflective electrode, a semi-transmissive electrode, or a transmissive electrode. In an embodiment, when the first electrode 11 is a transmissive electrode, the material for forming the first electrode 11 may be indium tin oxide (ITO), indium zinc oxide (IZO), tin oxide ($SnO_2$), zinc oxide (ZnO), or any combination thereof, but embodiments of the present disclosure are not limited thereto. In one or more embodiments, when the first electrode 110 is a semi-transmissive electrode or a reflective electrode, the material for forming the first electrode 11 may be magnesium (Mg), silver (Ag), aluminum (Al), aluminum-lithium (Al—Li), calcium (Ca), magnesium-indium (Mg—In), magnesium-silver (Mg—Ag), or any combination thereof, but embodiments of the present disclosure are not limited thereto.

The first electrode 11 may have a single-layered structure or a multi-layered structure including two or more layers.

[Emission Layer 15]

The emission layer 15 may include the heterocyclic compound.

A thickness of the emission layer may be in a range of about 100 Å to about 1,000 Å, for example, about 200 Å to about 600 Å. When the thickness of the emission layer is within these ranges, excellent luminescence characteristics may be obtained without a substantial increase in driving voltage.

Figure 4A:
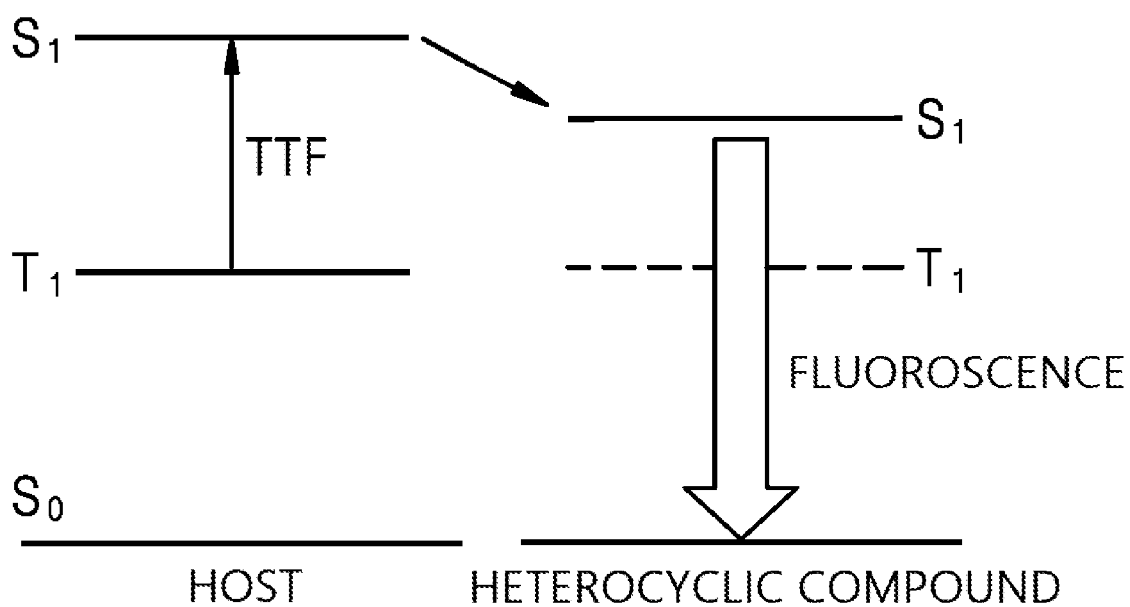
FIGS. 4A to 4E are each diagram illustrating energy levels in an emission layer of an organic light-emitting device according to an exemplary embodiment.

First Embodiment—Descriptions of FIG. 4A

In the First Embodiment, the heterocyclic compound may be a fluorescence emitter. According to the First Embodiment, the emission layer may further include a host (hereinafter, referred to as 'Host A' which is not identical to the heterocyclic compound). Host A may be understood by referring to a host material described below, but embodiments are not limited thereto. Host A may be a fluorescent host.

FIG. 4A depicts the general energy transfer of the First Embodiment.

Singlet excitons may be generated in Host A included in the emission layer, and these singlet excitons may be transferred to a fluorescence emitter through Förster energy transfer (FRET).

Since the singlet excitons generated in Host A accounts for only 25% of the total excitons, triplet excitons which accounts for 75% of the total excitons may be fused to one another to be converted into singlet excitons. Accordingly, efficiency of the organic light-emitting device may be further improved. That is, by using a triplet-triplet fusion mechanism, the efficiency of the organic light-emitting device may be further improved.

According to the First Embodiment, emission components emitted from the heterocyclic compound may account for about 80% or more, for example, about 90% or more, of the total emission components emitted from the emission layer. For example, emission components emitted from the heterocyclic compound may account for about 95% or more of the total emission components emitted from the emission layer.

Here, the heterocyclic compound may emit fluorescence, and the host may not emit light.

In the First Embodiment, when the emission layer further includes Host A in addition to the heterocyclic compound, an amount of the heterocyclic compound may be about 50 parts by weight or less, for example, about 30 parts by weight or less, based on 100 parts by weight of the emission layer, and an amount of Host A in the emission layer may be about 50 parts by weight or more, for example, about 70 parts by weight or more, based on 100 parts by weight of the emission layer. However, embodiments of the present disclosure are not limited thereto.

In the First Embodiment, when the emission layer further includes Host A in addition to the heterocyclic compound, Host A and the heterocyclic compound may satisfy Condition A:

$$E(H_A)_{S1} > E_{S1} \quad \text{Condition A}$$

wherein, in Condition A, $E(H_A)_{S1}$ indicates a lowest excited singlet energy level of Host A, and $E_{S1}$ indicates a lowest excited singlet energy level of the heterocyclic compound.

Here, $E(H_A)_{S1}$ and $E_{S1}$ may be evaluated using the DFT method of the Gaussian program with structure optimization performed at a degree of B3LYP/6-31G(d,p).

Figure 4B:
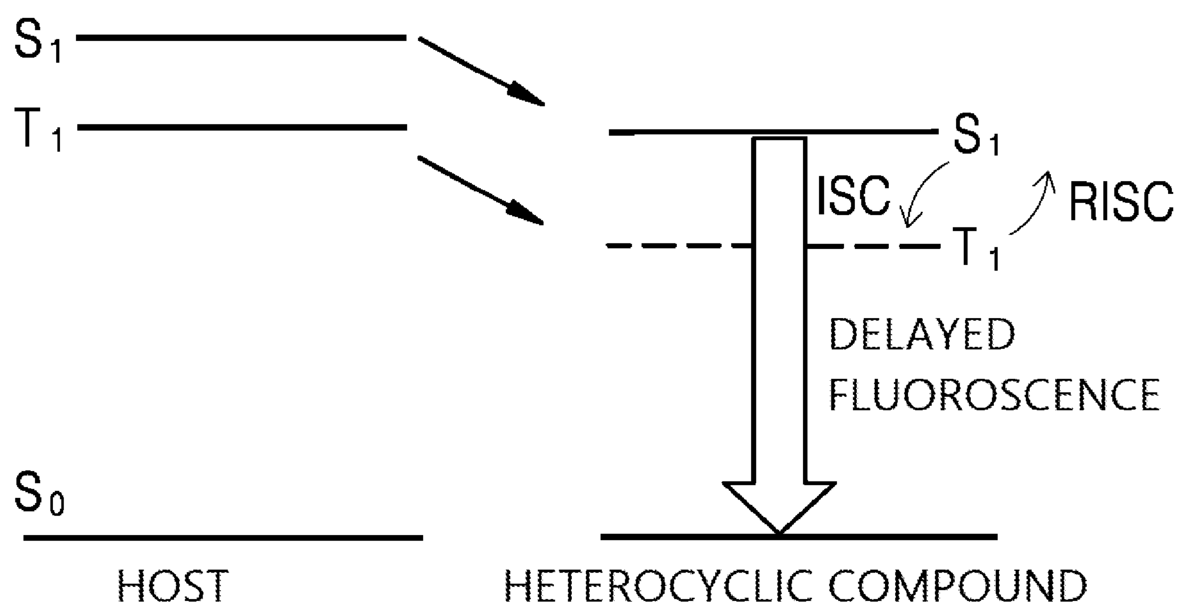

Second Embodiment—Descriptions of FIG. 4B

In the Second Embodiment, the heterocyclic compound may be a delayed fluorescence emitter. According to the Second Embodiment, the emission layer may further include a host (hereinafter, referred to as 'Host B' which is not identical to the heterocyclic compound). Host B may be understood by referring a host material described below, but embodiments are not limited thereto.

FIG. 4B depicts the general energy transfer of the Second Embodiment.

Singlet excitons generated at a ratio of 25% in Host B included in the emission layer may be transferred to a delayed fluorescence emitter through FRET. In addition, triplet excitons generated at a ratio of 75% in Host B included in the emission layer may be transferred to a delayed fluorescence emitter through Dexter energy transfer. The energy transferred to a triplet state of the delayed fluorescence emitter may undergo reverse intersystem crossing (RISC) to a singlet state. Accordingly, by transferring all the singlet excitons and triplet excitons generated in the emission layer to the heterocyclic compound, the organic light-emitting device with improved efficiency may be obtained.

According to the Second Embodiment, emission components emitted from the heterocyclic compound may account for about 80% or more, for example, about 90% or more, of the total emission components emitted from the emission layer. For example, emission components emitted from the heterocyclic compound may account for about 95% or more of the total emission components emitted from the emission layer.

Here, the heterocyclic compound may emit fluorescence and/or delayed fluorescence, and the emission components of the heterocyclic compound may be a total of prompt emission components of the heterocyclic compound and delayed fluorescence components by RISC of the heterocyclic compound. In addition, Host B may not emit light.

In the Second Embodiment, when the emission layer further includes Host B in addition to the heterocyclic compound, an amount of the heterocyclic compound may be about 50 parts by weight or less, for example, about 30 parts by weight or less, based on 100 parts by weight of the emission layer, and an amount of Host B in the emission layer may be about 50 parts by weight or more, for example, about 70 parts by weight or more, based on 100 parts by weight of the emission layer. However, embodiments of the present disclosure are not limited thereto.

In the Second Embodiment, when the emission layer further includes Host B in addition to the heterocyclic compound, Host B and the heterocyclic compound may satisfy Condition B:

$$E(H_B)_{S1} > E_{S1} \quad \text{Condition B}$$

wherein, in Condition B, $E(H_B)_{S1}$ indicates a lowest excited singlet energy level of Host B, and $E_{S1}$ indicates a lowest excited singlet energy level of the heterocyclic compound.

Here, $E(H_B)_{S1}$ and $E_{S1}$ may be evaluated using the DFT method of the Gaussian program with structure optimization performed at a degree of B3LYP/6-31G(d,p).

Third Embodiment and Fourth Embodiment

Figure 4C:
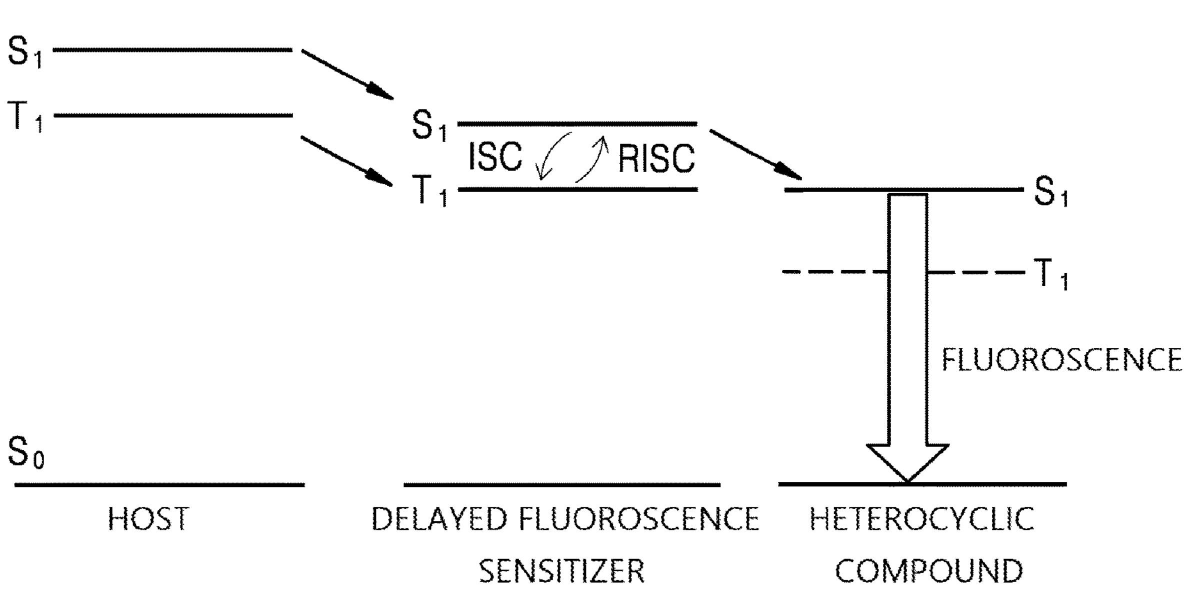

Third Embodiment—Descriptions of FIG. 4C

In the Third Embodiment, the heterocyclic compound may be used as a fluorescent emitter, and the emission layer may include a sensitizer, for example, a delayed fluorescence sensitizer. In the Third Embodiment, the emission layer may further include a host (hereinafter, referred to as 'Host C' which is not identical to the heterocyclic compound and the sensitizer) and a sensitizer (hereinafter, referred to as 'Sensitizer A' which is not identical to Host C and the heterocyclic compound). Host C and Sensitizer A may respectively be understood by referring to a host material and a sensitizer material described below, but embodiments are not limited thereto.

According to the Third Embodiment, emission components emitted from the heterocyclic compound may account for about 80% or more, for example, about 90% or more (and for example, about 95% or more), of the total emission components emitted from the emission layer. For example, the heterocyclic compound may emit fluorescence. In addition, Host C and Sensitizer A may not each emit light.

FIG. 4C depicts the general energy transfer of the Third Embodiment.

Singlet and triplet excitons may be generated in Host C included in the emission layer, and these singlet and triplet excitons may be transferred to Sensitizer A first, and then to the heterocyclic compound through FRET. The singlet excitons generated at a ratio of 25% in Host C may be transferred to Sensitizer A through FRET, and the energy of triplet excitons generated at a ratio of 75% in Host C may be transferred to a singlet state and a triplet state of Sensitizer A, wherein the energy transferred to the triplet state may undergo RISC to the singlet state, and then, the singlet energy of Sensitizer A may be transferred to the heterocyclic compound through FRET.

Accordingly, by transferring all the singlet excitons and triplet excitons generated in the emission layer to a dopant, an organic light-emitting device having improved efficiency may be obtained. In addition, since an organic light-emitting device thus obtained has significantly reduced energy loss, lifespan characteristics thereof may be also improved.

In the Third Embodiment, when the emission layer further includes, in addition to the heterocyclic compound, Host C and Sensitizer A, Host C and Sensitizer A may satisfy Condition C-1 and/or C-2:

$$S_1(H_C) \geq S_1(S_A) \quad \text{Condition C-1}$$

$$S_1(S_A) \geq S_1(\text{HC}) \quad \text{Condition C-2}$$

wherein, in Conditions C-1 and C-2, $S_1(H_C)$ indicates a lowest excited singlet energy level of Host C, $S_1(S_A)$ indicates a lowest excited singlet energy level of Sensitizer A, and $S_1$(HC) indicates a lowest excited singlet energy level of the heterocyclic compound.

$S_1(H_C)$, $S_1(S_A)$, and $S_1$(HC) may be evaluated using the DFT method of the Gaussian program with structure optimization performed at a degree of B3LYP/6-31 G(d,p).

When Host C, Sensitizer A, and the heterocyclic compound satisfy Condition C-1 and/or C-2, FRET from Sensitizer A to the heterocyclic compound may be facilitated, and accordingly, the organic light-emitting device may have improved luminescence efficiency.

Figure 4D:
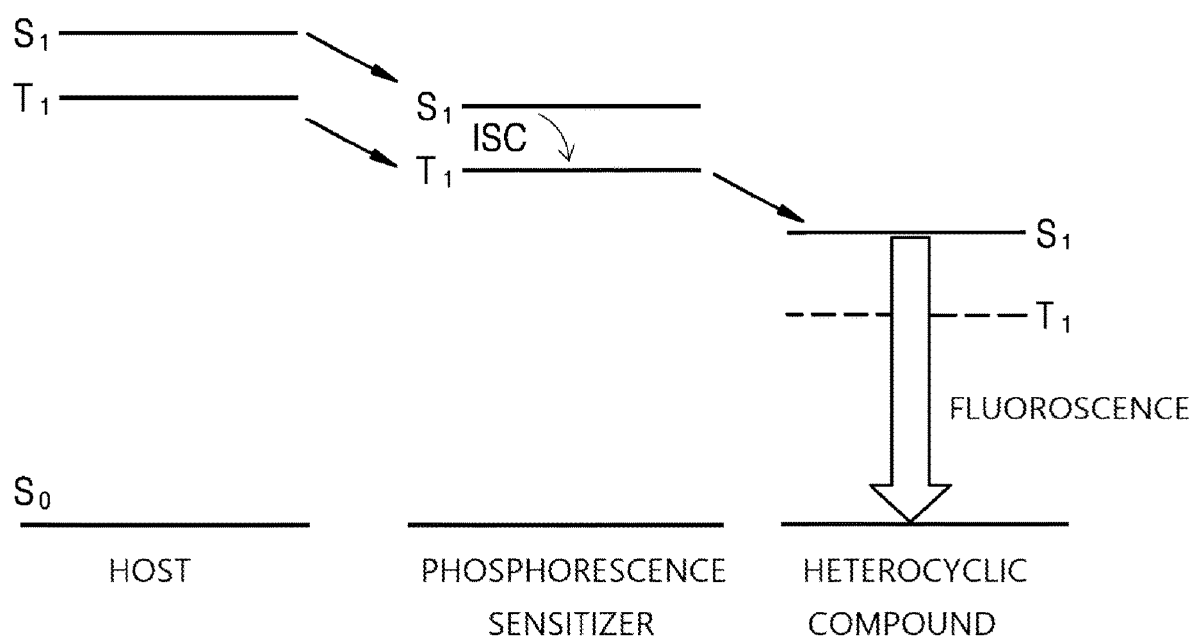

Fourth Embodiment—Descriptions of FIG. 4D

In the Fourth Embodiment, the heterocyclic compound may be used as a fluorescence emitter, and the emission layer may include a sensitizer, for example, a phosphorescence sensitizer. In the Fourth Embodiment, the emission layer may further include a host (hereinafter, referred to as 'Host D' which is not identical to the heterocyclic compound and the sensitizer) and a sensitizer (hereinafter, referred to as 'Sensitizer B' which is not identical to Host D and the heterocyclic compound). Host D and Sensitizer B may respectively be understood by referring to a host material and a sensitizer material described below, but embodiments are not limited thereto.

According to the Fourth Embodiment, emission components emitted from the heterocyclic compound may account for about 80% or more, for example, about 90% or more (and for example, about 95% or more), of the total emission components emitted from the emission layer. For example, the heterocyclic compound may emit fluorescence. In addition, Host D and Sensitizer B may not each emit light.

FIG. 4D depicts the general energy transfer of the Fourth Embodiment.

Triplet excitons generated at a ratio of 3:1 (i.e., 75%) in Host D included in the emission layer may be transferred to Sensitizer B through Dexter energy transfer, and energy of singlet excitons generated at a ratio of 1:3 (i.e., 25%) in Host D may be transferred to a singlet state and a triplet state of Sensitizer B, wherein the energy transferred to the singlet state of Sensitizer B may undergo ISC to the triplet state, and then, the triplet energy of Sensitizer B may be transferred to the heterocyclic compound through FRET.

Accordingly, by transferring all the singlet excitons and triplet excitons generated in the emission layer to a dopant, an organic light-emitting device having improved efficiency may be obtained. In addition, since an organic light-emitting device thus obtained has significantly reduced energy loss, lifespan characteristics thereof may be also improved.

In the Third Embodiment, when the emission layer further includes, in addition to the heterocyclic compound, Host D and Sensitizer B, Host D and Sensitizer B may satisfy Condition D-1 and/or D-2:

$$T_1(H_D) \geq T_1(S_B) \quad \text{Condition D-1}$$

$$T_1(S_B) \geq S_1(\text{HC}) \quad \text{Condition D-2}$$

wherein, in Conditions D-1 and D-2, $T_1(H_D)$ indicates a lowest excited triplet energy level of Host D, $T_1(S_B)$ indicates a lowest excited triplet energy level of Sensitizer B, and $S_1$(HC) indicates a lowest excited singlet energy level of the heterocyclic compound.

$T_1(H_D)$, $T_1(S_B)$, and $S_1$(HC) may be evaluated using the DFT method of the Gaussian program with structure optimization performed at a degree of B3LYP/6-31G (d,p).

When Host D, Sensitizer B, and the heterocyclic compound satisfy Condition D-1 and/or D-2, FRET from Sensitizer B to the heterocyclic compound may be facilitated, and accordingly, the organic light-emitting device may have improved luminescence efficiency.

In the Third Embodiment and the Fourth Embodiment, an amount of the sensitizer in the emission layer may be in a range of about 5 wt % to about 50 wt %, for example, about 10 wt % to about 30 wt %. Within these ranges, the energy transfer in the emission layer may be effectively achieved, and accordingly, an organic light-emitting device having high efficiency and a long lifespan may be obtained.

In the Third Embodiment and the Fourth Embodiment, an amount of the heterocyclic compound in the emission layer may be in a range of about 0.01 wt % to about 15 wt %, for example, about 0.05 wt % to about 3 wt %, but embodiments are not limited thereto.

In the Third Embodiment and the Fourth Embodiment, the sensitizer and the heterocyclic compound may further satisfy Condition 5:

$$0\ \mu s < T_{decay}(HC) < 5\ \mu s \qquad \text{Condition 5}$$

wherein, in Condition 5, $T_{decay}$(HC) indicates a decay time of the heterocyclic compound.

The decay time of the heterocyclic compound was measured from a time-resolved photoluminescence (TRPL) spectrum at room temperature of a film (hereinafter, referred to as "Film HC") having a thickness of 40 nm formed by vacuum-depositing the host and the heterocyclic compound included in the emission layer on a quartz substrate at a weight ratio of 90:10 at a vacuum pressure of $10^{-7}$ torr.

Figure 4E:
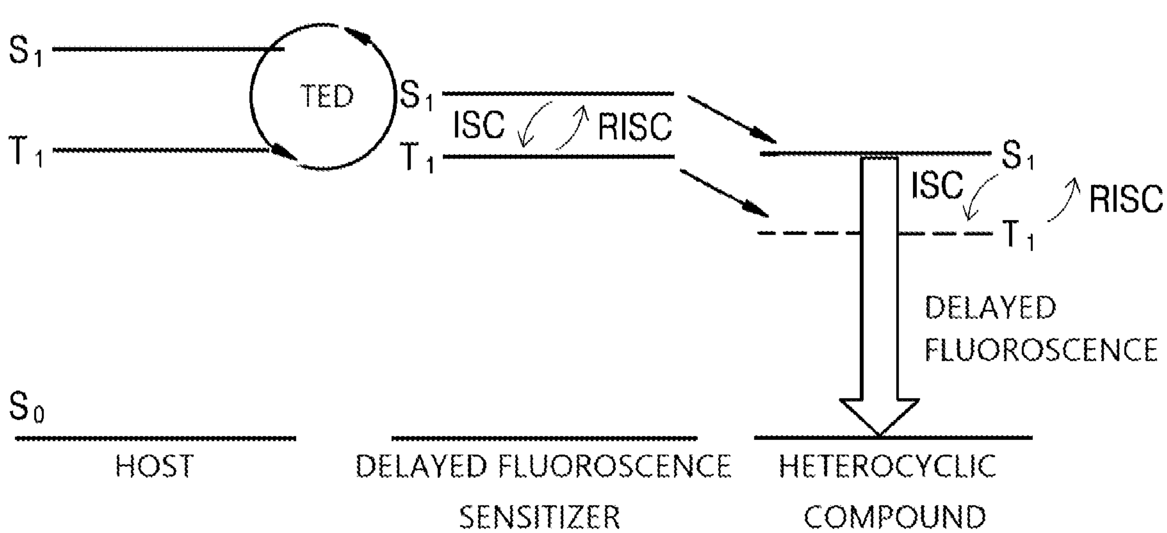

Fifth Embodiment—Descriptions of FIG. 4E

In the Fifth Embodiment, the heterocyclic compound may be used as a delayed fluorescence emitter, and the emission layer may include a sensitizer, for example, a delayed fluorescence sensitizer. In the Fifth Embodiment, the emission layer may further include a host (hereinafter, referred to as 'Host E' which is not identical to the heterocyclic compound and the sensitizer) and a sensitizer (hereinafter, referred to as 'Sensitizer C' which is not identical to Host E and the heterocyclic compound). Host E and Sensitizer C may respectively be understood by referring to a host material and a sensitizer material described below, but embodiments are not limited thereto.

According to the Fifth Embodiment, emission components emitted from the heterocyclic compound may account for about 80% or more, for example, about 90% or more (and for example, about 95% or more), of the total emission components emitted from the emission layer. For example, the heterocyclic compound may emit fluorescence and/or delayed fluorescence. In addition, Host E and Sensitizer C may not each emit light.

Here, the heterocyclic compound may emit fluorescence and/or delayed fluorescence, and the emission components of the heterocyclic compound may be a total of prompt emission components of the heterocyclic compound and delayed fluorescence components by RISC of the heterocyclic compound.

FIG. 4E depicts the general energy transfer of the Fifth Embodiment.

Singlet excitons generated at a ratio of 25% in Host E included in the emission layer may be transferred to a singlet state of Sensitizer C through FRET, and energy of triplet excitons generated at a ratio of 75% in Host E may be transferred to a triplet state of Sensitizer C, wherein the energy transferred to the singlet state of Sensitizer B may undergo ISC to the triplet state, and then, the triplet energy of Sensitizer B may be transferred to the heterocyclic compound through FRET. The energy transferred to the triplet state of Sensitizer C may undergo RISC to the singlet state. In addition, in the case of Sensitizer C, the energy of the triplet excitons generated in Sensitizer C may undergo reverse transfer to Host E first, and then to the heterocyclic compound, thereby emitting light by reverse intersystem transfer.

Accordingly, by transferring all the singlet excitons and triplet excitons generated in the emission layer to a dopant, an organic light-emitting device having improved efficiency may be obtained. In addition, since an organic light-emitting device thus obtained has significantly reduced energy loss, lifespan characteristics thereof may be also improved.

In the Fifth Embodiment, when the emission layer further includes, in addition to the heterocyclic compound, Host E and Sensitizer C, Host E and Sensitizer C may satisfy Condition E-1, E-2, and/or E-3:

$$S_1(H_E) \geq S_1(S_C) \qquad \text{Condition E-1}$$

$$S_1(S_C) \geq S_1(\text{HC}) \qquad \text{Condition E-2}$$

$$T_1(S_C) \geq T_1(\text{HC}) \qquad \text{Condition E-3}$$

wherein, in Conditions E-1, E-2, and E-3, $S_1(H_E)$ indicates a lowest excited singlet energy level of Host E, $S_1(S_C)$ indicates a lowest excited singlet energy level of Sensitizer C, $S_1$(HC) indicates a lowest excited singlet energy level of the heterocyclic compound, $T_1(S_C)$ indicates a lowest excited triplet energy level of Sensitizer C, and $T_1$(HC) indicates a lowest excited triplet energy level of the heterocyclic compound.

$S_1(H_E)$, $S_1(S_C)$, $S_1$(HC), $T_1(S_C)$, and $T_1$(HC) may be evaluated using the DFT method of the Gaussian program with structure optimization performed at a degree of B3LYP/6-31 G(d,p).

When Host E, Sensitizer C, and the heterocyclic compound satisfy Condition E-1, E-2, and/or E-3, Dexter transfer and FRET from Sensitizer C to the heterocyclic compound may be facilitated, and accordingly, the organic light-emitting device may have improved luminescence efficiency.

In the Fifth Embodiment, an amount of Sensitizer C in the emission layer may be in a range of about 5 wt % to about 50 wt %, for example, about 10 wt % to about 30 wt %. Within these ranges, the energy transfer in the emission layer may be effectively achieved, and accordingly, an organic light-emitting device having high efficiency and a long lifespan may be obtained.

In the Fifth Embodiment, an amount of the heterocyclic compound in the emission layer may be in a range of about 0.01 wt % to about 15 wt %, for example, about 0.05 wt % to about 3 wt %, but embodiments are not limited thereto.

[Host in Emission Layer 15]

The host may include no metal atom.

In an embodiment, the host may include one kind of host. When the host includes one kind of host, the one host may be a bipolar host, an electron-transporting host, or a hole-transporting host, which will be described below.

In one or more embodiments, the host may include a mixture of two or more different types of host. For example, the host may be a mixture of an electron-transporting host and a hole-transporting host, a mixture of two types of electron-transporting hosts different from each other, or a mixture of two types of hole-transporting hosts different from each other. The electron-transporting host and the hole-transporting host may be understood by referring to the related descriptions provided below.

In one or more embodiments, the host may include an electron-transporting host including at least one electron-transporting moiety and a hole-transporting host that is free of an electron-transporting moiety.

In an embodiment, the electron-transporting moiety used herein may be a cyano group, a π electron-depleted nitrogen-containing cyclic group, and a group represented by one of the following formulae:

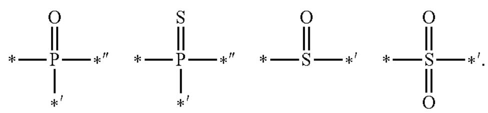

In the formulae, *, *', and *" each indicate a binding site to a neighboring atom.

In one or more embodiments, the electron-transporting host included in the emission layer 15 may include at least one of a cyano group and a π electron-depleted nitrogen-containing cyclic group.

In one or more embodiments, the electron-transporting host included in the emission layer 15 may include at least one cyano group.

In one or more embodiments, the electron-transporting host included in the emission layer 15 may include at least one cyano group and at least one π electron depleted nitrogen-containing cyclic group.

In one or more embodiments, the host may include an electron-transporting host and a hole-transporting host, wherein the electron-transporting host may include at least one π electron-depleted nitrogen-free cyclic group and at least one electron-transporting moiety, and the hole-transporting host may include at least one π electron-depleted nitrogen-free cyclic group and may not include an electron-transporting moiety.

The term "π electron-depleted nitrogen-containing cyclic group" as used herein refers to a cyclic group having at least one *—N=*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group; and a condensed cyclic group in which two or more π electron-efficient nitrogen-containing cyclic groups are condensed with each other.

Meanwhile, the π electron-depleted nitrogen-free cyclic group may be: a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a triindolobenzene group, or a condensed cyclic group of two or more π electron-depleted nitrogen-free cyclic groups, but embodiments of the present disclosure are not limited thereto.

In one or more embodiments, the electron-transporting host may be compounds represented by Formula E-1, and the hole-transporting host may be a compound represented by Formula H-1, but embodiments of the present disclosure are not limited thereto:

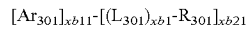

$[Ar_{301}]_{xb11}$-$[(L_{301})_{xb1}$-$R_{301}]_{xb21}$ <Formula E-1> wherein, in Formula E-1, $Ar_{301}$ may be a substituted or unsubstituted $C_5$-$C_{60}$ carbocyclic group or a substituted or unsubstituted $C_1$-$C_{60}$ heterocyclic group, xb11 may be 1, 2, or 3, $L_{301}$ may be a single bond, a group represented by one of the following formulae, a substituted or unsubstituted $C_5$-$C_{60}$ carbocyclic group, or a substituted or unsubstituted $C_1$-$C_{60}$ heterocyclic group, wherein *, *', and *" in the following formulae each indicate a binding site to a neighboring atom,

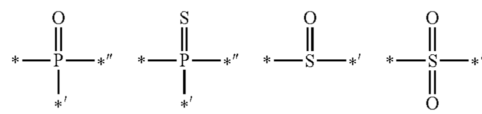

xb1 may be an integer from 1 to 5, $R_{301}$ may be hydrogen, deuterium, —F, —Cl, —Br, —I, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent aromatic condensed polycyclic group, a substituted or unsubstituted monovalent aromatic condensed heteropolycyclic group, a substituted or unsubstituted monovalent non-aromatic condensed polycyclic group, a substituted or unsubstituted monovalent non-aromatic condensed heteropolycyclic group, $—Si(Q_{301})(Q_{302})(Q_{303})$, $—N(Q_{301})(Q_{302})$, $—B(Q_{301})(Q_{302})$, $—C(=O)(Q_{301})$, $—S(=O)_2(Q_{301})$, $—S(=O)(Q_{301})$, $—P(=O)(Q_{301})(Q_{302})$, or $—P(=S)(Q_{301})(Q_{302})$, xb21 may be an integer from 1 to 5, $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, and at least one of Conditions H-1 to H-3 may be satisfied:

Condition H-1:

at least one of $Ar_{301}$, $L_{301}$, and $R_{301}$ in Formula E-1 each independently includes a π electron-depleted nitrogen-containing cyclic group, Condition H-2:

$L_{301}$ in Formula E-1 is a group represented by one of the following formulae:

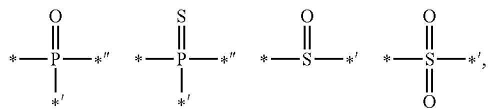

and

Condition H-3:

$R_{301}$ in Formula E-1 is a cyano group, $-S(=O)_2(Q_{301})$, $-S(=O)(Q_{301})$, $-P(=O)(Q_{301})(Q_{302})$, and $-P(=S)(Q_{301})(Q_{302})$, <Formula H-1>

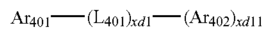

11

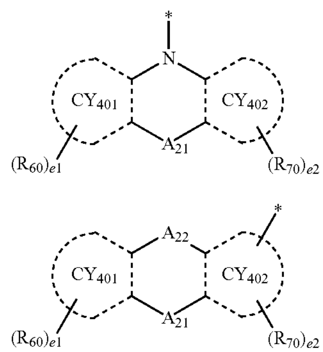

12 wherein, in Formulae H-1, 11, and 12, $L_{401}$ may be:

a single bond; or a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, $-Si(Q_{401})(Q_{402})(Q_{403})$, or any combination thereof, xd1 may be an integer from 1 to 10, wherein, when xd1 is 2 or more, two or more of $L_{401}$ may be identical to or different from each other, $Ar_{401}$ may be a group represented by Formulae 11 and 12, $Ar_{402}$ may be:

a group represented by Formulae 11 or 12, a phenyl group, a naphthyl group, a fluorenyl group, a carbazolyl group, a dibenzofuranyl group, a dibenzothiophenyl group, a biphenyl group, a terphenyl group, or a triphenylenyl group; or a phenyl group, a naphthyl group, a fluorenyl group, a carbazolyl group, a dibenzofuranyl group, a dibenzothiophenyl group, a biphenyl group, a terphenyl group, or a triphenylenyl group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group, a terphenyl group, a triphenylenyl group, or any combination thereof, $CY_{401}$ and $CY_{402}$ may each independently be a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonaphthothiophene group, or a benzonaphthosilole group, $A_{21}$ may be a single bond, O, S, $N(R_{51})$, $C(R_{51})(R_{52})$, or $Si(R_{51})(R_{52})$, $A_{22}$ may be a single bond, O, S, $N(R_{53})$, $C(R_{53})(R_{54})$, or $Si(R_{53})(R_{54})$, at least one of $A_{21}$ and $A_{22}$ in Formula 12 may not be a single bond, $R_{51}$ to $R_{54}$, $R_{60}$, and $R_{70}$ may each independently be:

hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, or any combination thereof;

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group);

a π electron-depleted nitrogen-free cyclic group (for example, a phenyl group, a naphthyl group, a fluorenyl group, a carbazolyl group, a dibenzofuranyl group, a dibenzothiophenyl group, a biphenyl group, a terphenyl group, and a triphenylenyl group), each substituted with at least one deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, a fluorenyl group, a carbazolyl group, a dibenzofuranyl group, a dibenzothiophenyl group, a biphenyl group or any combination thereof; or $—Si(Q_{404})(Q_{405})(Q_{406})$, e1 and e2 may each independently be an integer from 0 to 10, $Q_{401}$ to $Q_{406}$ may each independently be hydrogen, deuterium, a hydroxyl group, an amino group, an amidino group, a hydrazine group, a hydrazone group, a carboxylic acid group or a salt thereof, a sulfonic acid group or a salt thereof, a phosphoric acid group or a salt thereof, a phenyl group, a naphthyl group, a fluorenyl group, a carbazolyl group, a dibenzofuranyl group, a dibenzothiophenyl group, a biphenyl group, a terphenyl group, or a triphenylenyl group, and

* indicates a binding site to a neighboring atom.

In an embodiment, $Ar_{301}$ and $L_{301}$ in Formula E-1 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, and $R_{301}$ may be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, a cyano-containing phenyl group, a cyano-containing biphenyl group, a cyano-containing terphenyl group, a cyano-containing tetraphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group, but embodiments of the present disclosure are not limited thereto.

In one or more embodiments, $Ar_{301}$ may be:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl)pyrimidinyl group, a triazinyl group, a phenyltriazinyl group, a diphenyltriazinyl group, a biphenyltriazinyl group, a di(biphenyl)triazinyl group, —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, —$P(=O)(Q_{31})(Q_{32})$, or any combination thereof; or a group represented by one of Formulae 5-1 to 5-3 or Formulae 6-1 to 6-33, and $L_{301}$ may be a group represented by one of Formulae 5-1 to 5-3 and Formulae 6-1 to 6-33:

5-1

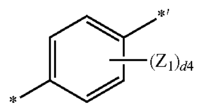

5-2

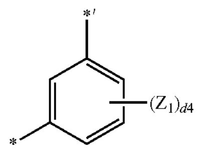

5-3

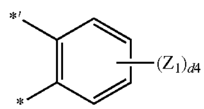

6-1

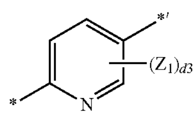

6-2

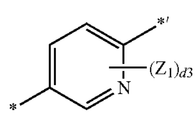

6-3

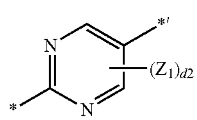

6-4

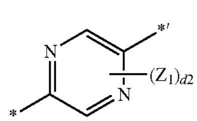

-continued 6-5

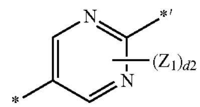

6-6

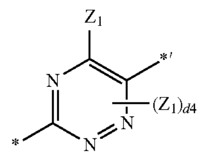

6-7

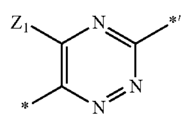

6-8

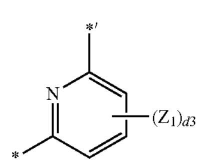

6-9

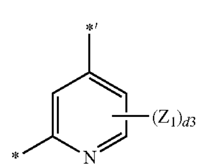

6-10

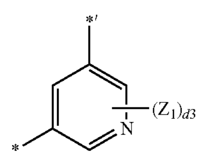

6-11

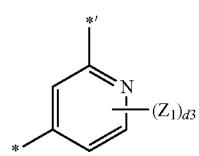

6-12

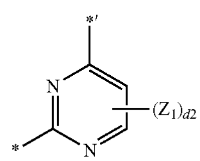

6-13

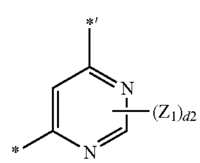

6-14

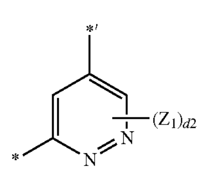

-continued 6-15

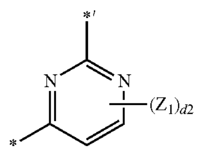

6-16

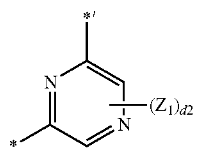

6-17

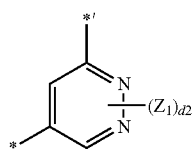

6-18

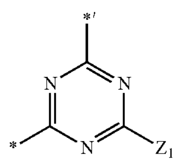

6-19

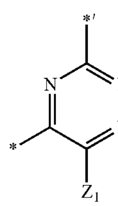

6-20

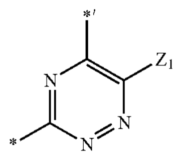

6-21

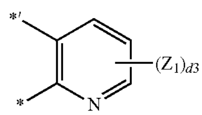

6-22

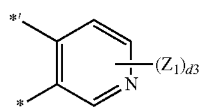

6-23

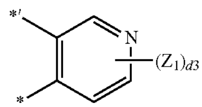

6-24

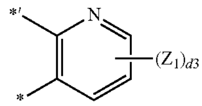

6-25

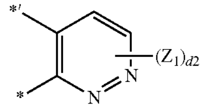

-continued 6-26

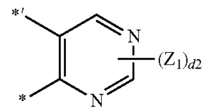

6-27

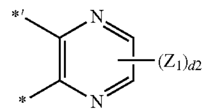

6-28

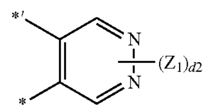

6-29

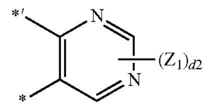

6-30

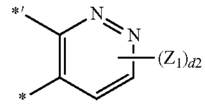

6-31

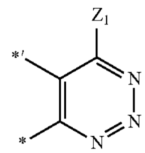

6-32

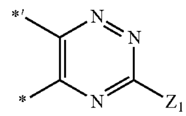

6-33

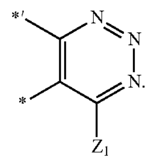

In Formulae 5-1 to 5-3 and 6-1 to 6-33, $Z_1$ may be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a cyano-containing phenyl group, a cyano-containing biphenyl group, a cyano-containing terphenyl group, a cyano-containing naphthyl group, a pyridinyl group, a phenylpyridinyl group, a diphenylpyridinyl group, a biphenylpyridinyl group, a di(biphenyl)pyridinyl group, a pyrazinyl group, a phenylpyrazinyl group, a diphenylpyrazinyl group, a biphenylpyrazinyl group, a di(biphenyl)pyrazinyl group, a pyridazinyl group, a phenylpyridazinyl group, a diphenylpyridazinyl group, a biphenylpyridazinyl group, a di(biphenyl)pyridazinyl group, a pyrimidinyl group, a phenylpyrimidinyl group, a diphenylpyrimidinyl group, a biphenylpyrimidinyl group, a di(biphenyl) pyrimidinyl group, a triazinyl group, a phenyltriazinyl group, a diphenyltriazinyl group, a biphenyltriazinyl group, a di(biphenyl)triazinyl group, —Si($Q_{31}$)($Q_{32}$)

$(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$, d4 may be 0, 1, 2, 3, or 4, d3 may be 0, 1, 2, or 3, d2 may be 0, 1, or 2,

* and *' each indicate a binding site to a neighboring atom, and $Q_{31}$ to $Q_{33}$ may respectively be the same as described herein.

In one or more embodiments, $L_{301}$ may be a group represented by Formulae 5-2, 5-3, and 6-8 to 6-33.

In one or more embodiments, $R_{301}$ may be a cyano group or a group represented by one of Formula 7-1 to 7-18, and at least one of $Ar_{402}$(s) in the number of xd11 may be a group represented by one of Formulae 7-1 to 7-18, but embodiments of the present disclosure are not limited thereto:

7-1

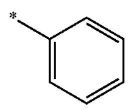

7-2

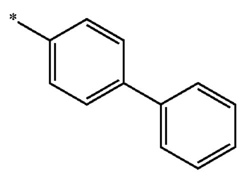

7-3

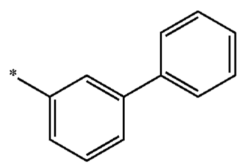

7-4

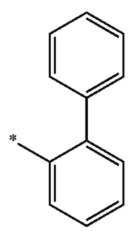

7-5

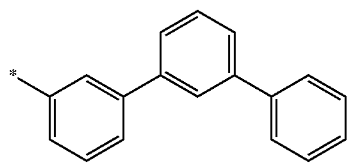

7-6

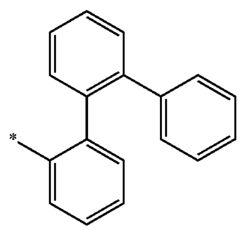

-continued 7-7

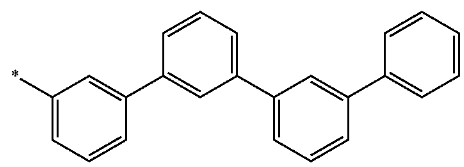

7-8

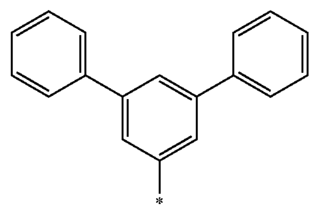

7-9

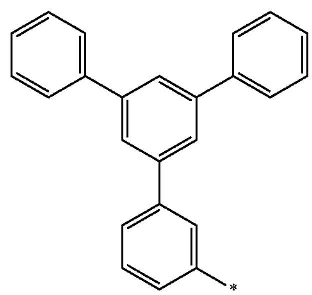

7-10

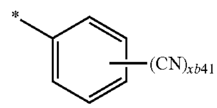

7-11

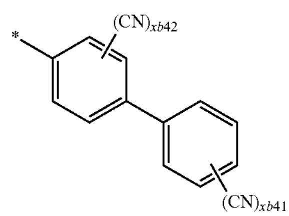

7-12

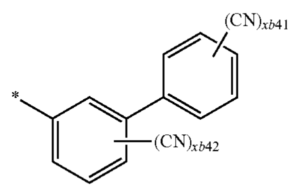

7-13

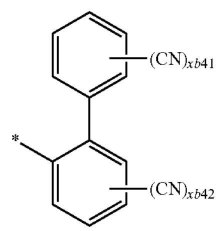

7-14

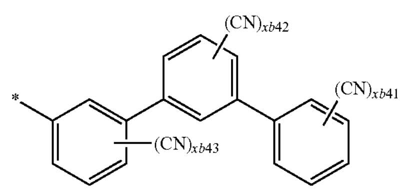

-continued 7-15

7-16

7-17

7-18

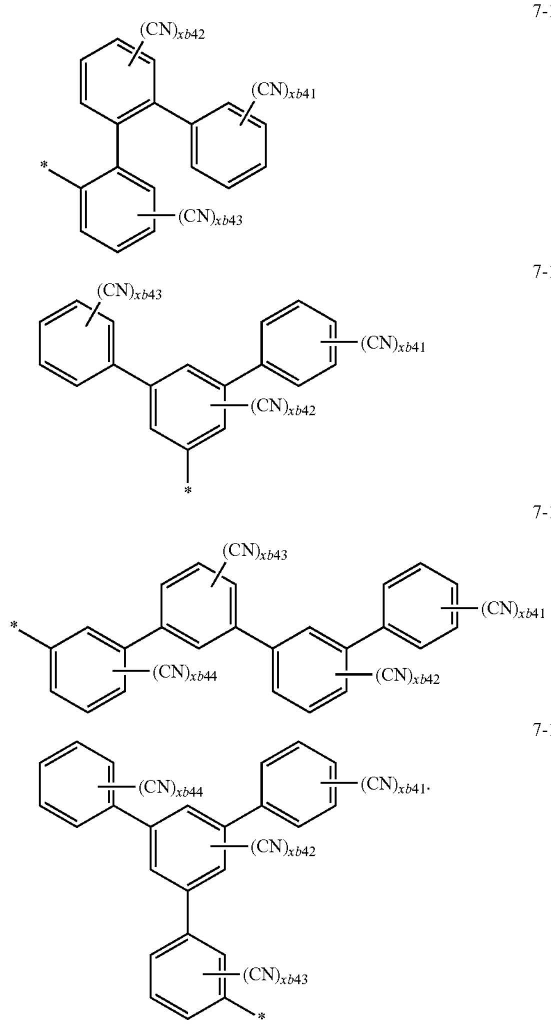

In Formulae 7-1 to 7-18, xb41 to xb44 may each be 0, 1, or 2, wherein xb41 in Formula 7-10 is not 0, the sum of xb41 and xb42 in Formulae 7-11 to 7-13 is not 0, the sum of xb41, xb42, and xb43 in Formulae 7-14 to 7-16 is not 0, the sum of xb41, xb42, xb43, and xb44 in Formulae 7-17 and 7-18 is not 0, and * indicates a binding site to a neighboring atom.

In Formula E-1, two or more of $Ar_{301}$ may be identical to or different from each other, and two or more of $L_{301}$ may be identical to or different from each other. In Formula H-1, two or more of $L_{401}$ may be identical to or different from each other, and two or more of $Ar_{402}$ may be identical to or different from each other.

In an embodiment, the electron-transporting host includes i) at least one of a cyano group, a pyrimidine group, a pyrazine group, a triazine group, or a combination thereof, or ii) a triphenylene group, and the hole-transporting host may include a carbazole group.

In one or more embodiments, the electron-transporting host may include at least one cyano group.

The electron-transporting host may be, for example, compounds of Groups HE1 to HE7, but embodiments of the present disclosure are not limited thereto:

Group HE1

H-E1

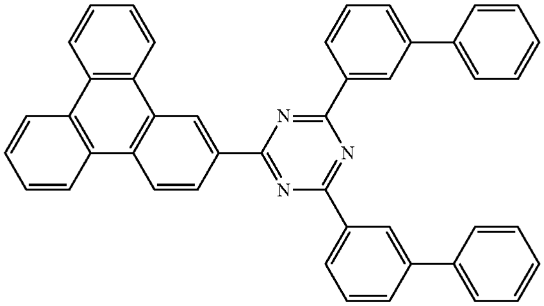

H-E2

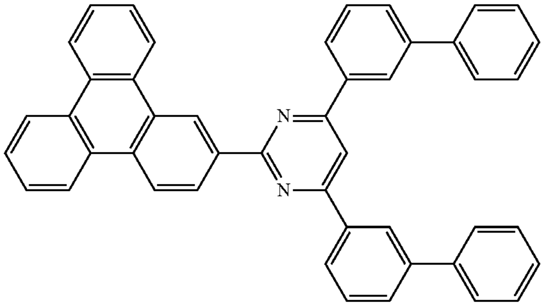

H-E3

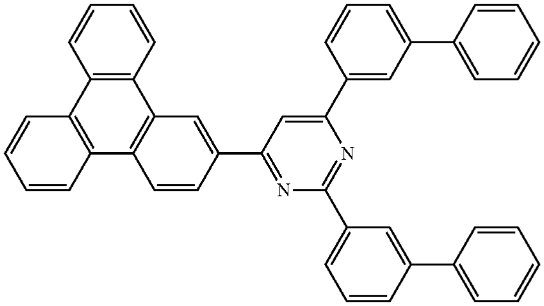

H-E4

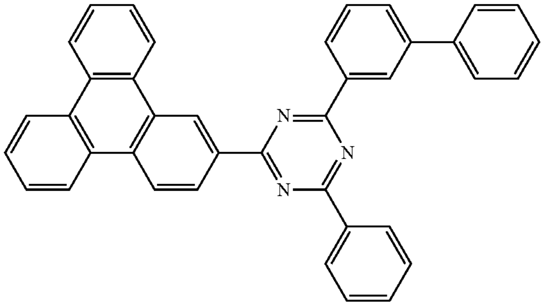

-continued
H-E5
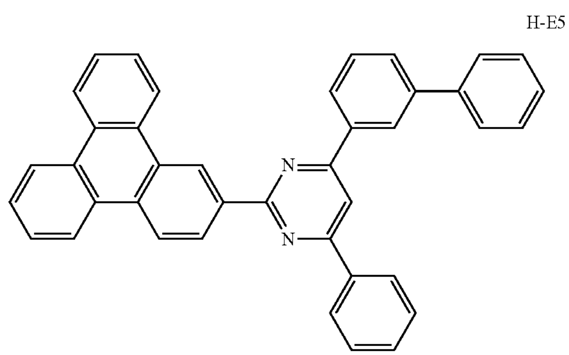
H-E6
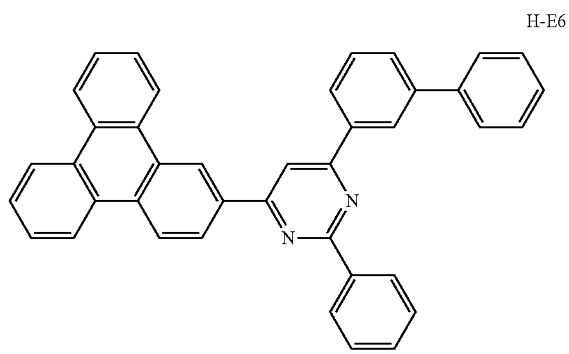
H-E7
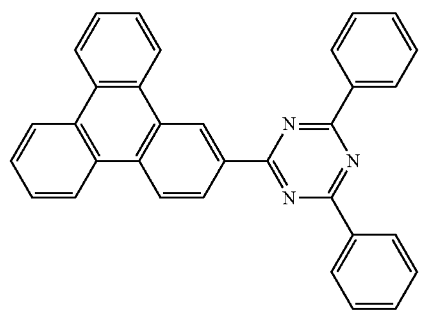
H-E8
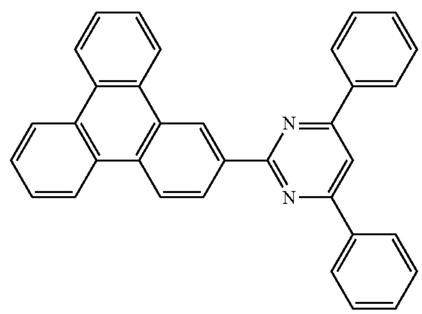
H-E9
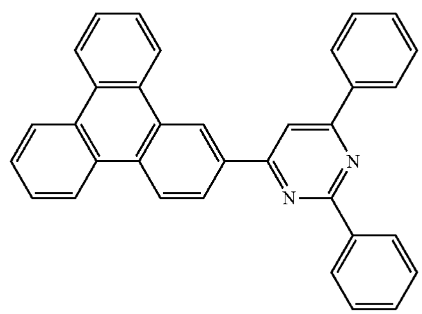
-continued
H-E10
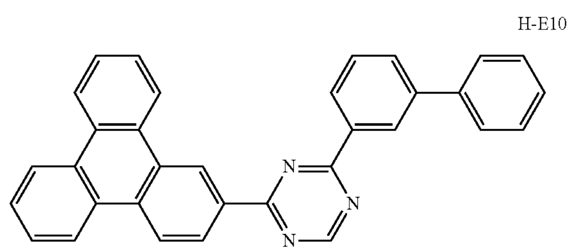
H-E11
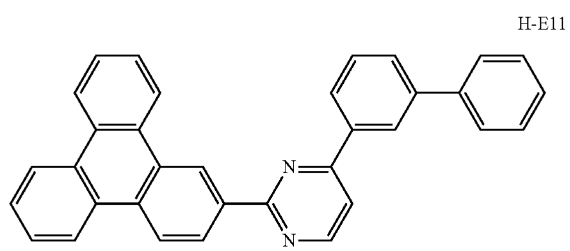
H-E12
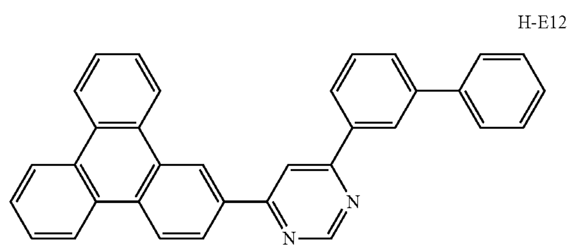
H-E13
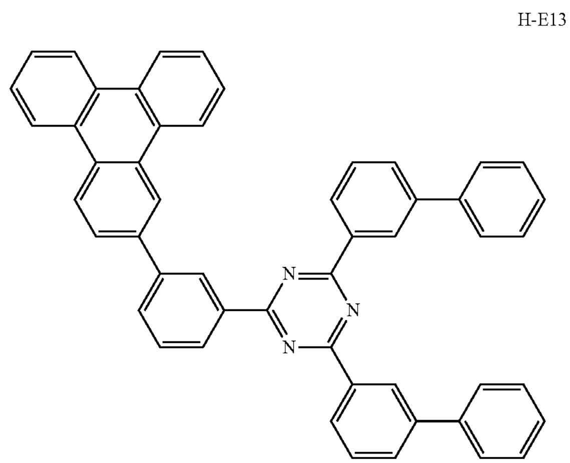
H-E14
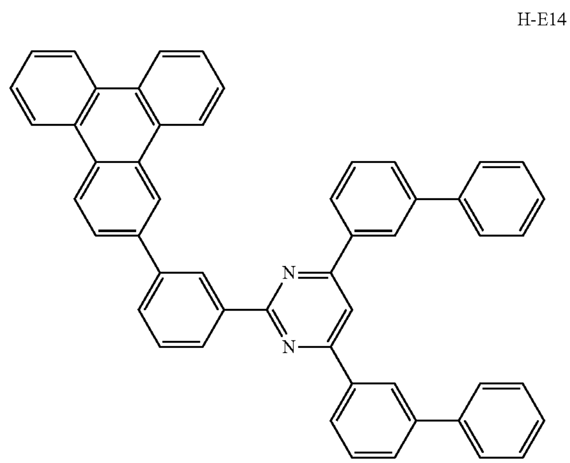

-continued
H-E15
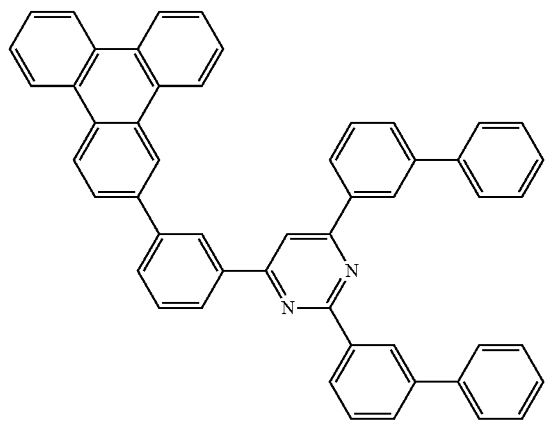
H-E16
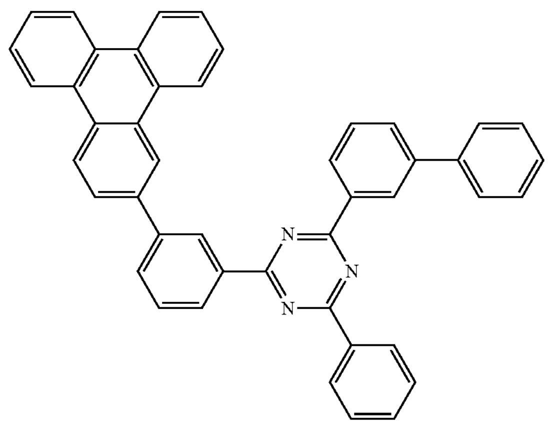
H-E17
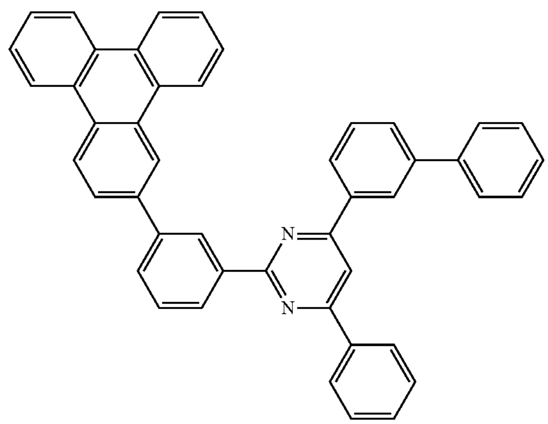
-continued
H-E18
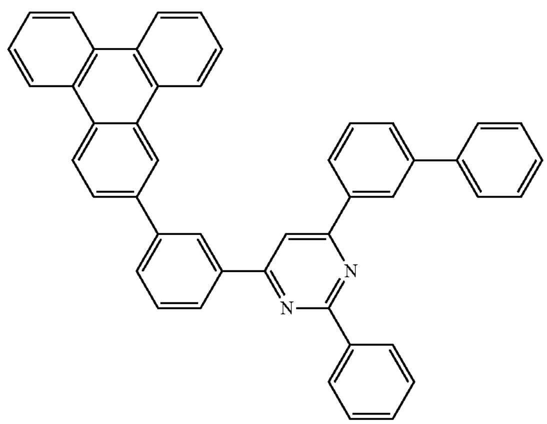
H-E19
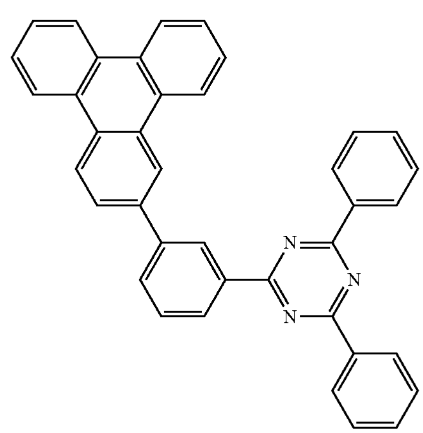
H-E20
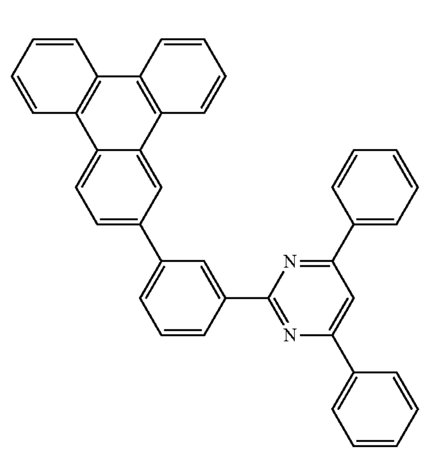

-continued
H-E21
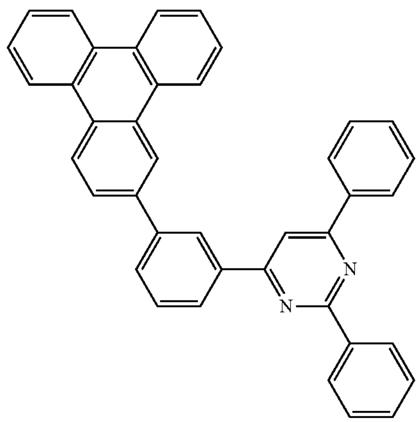
H-E22
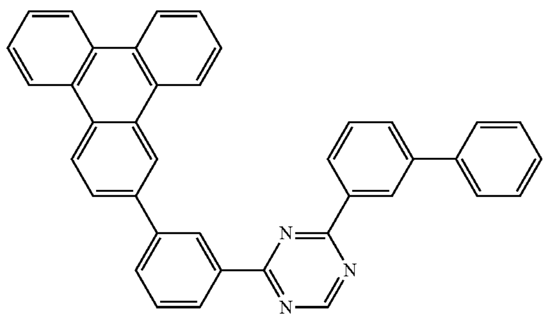
H-E23
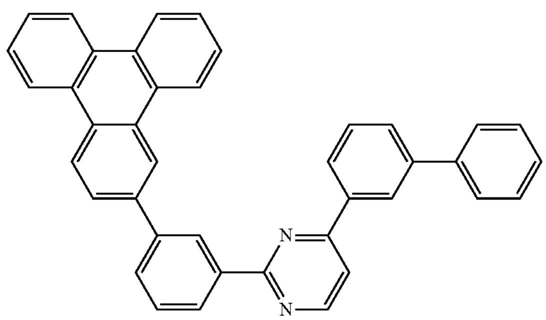
H-E24
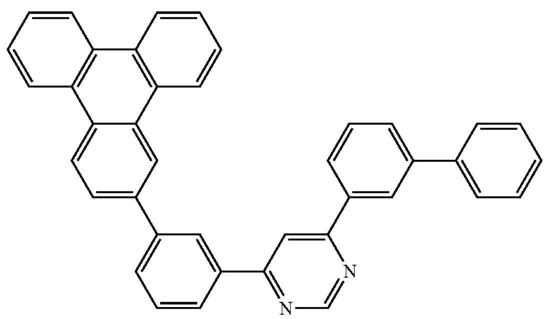
-continued
H-E25
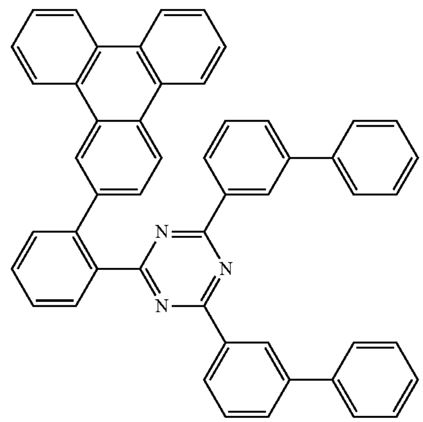
H-E26
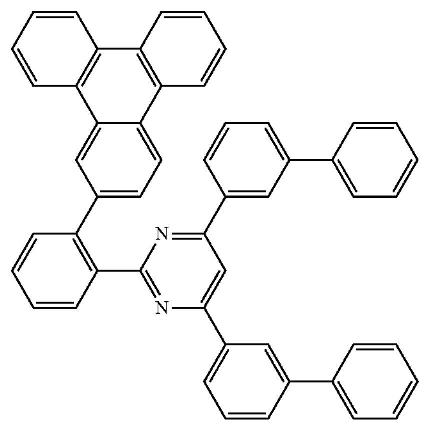
H-E27
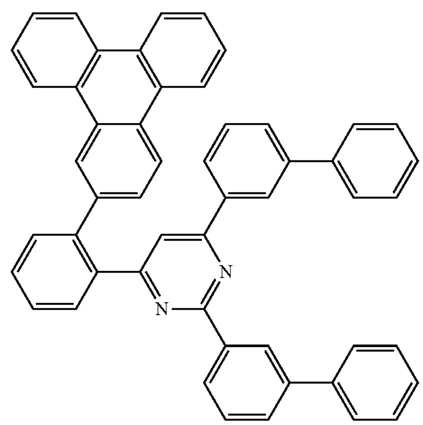

-continued
H-E28
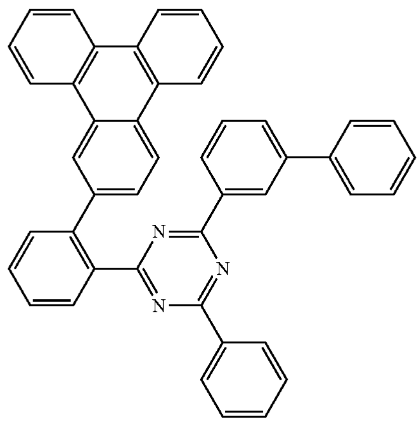
H-E29
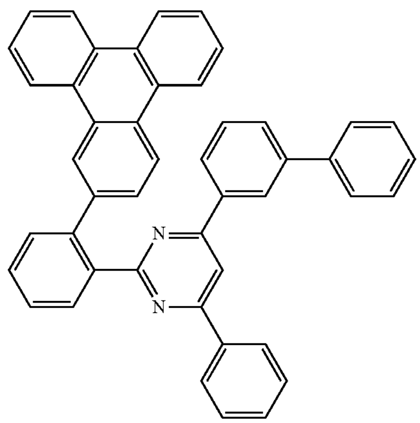
H-E30
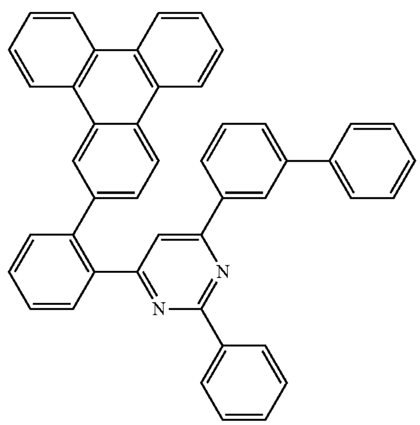
-continued
H-E31
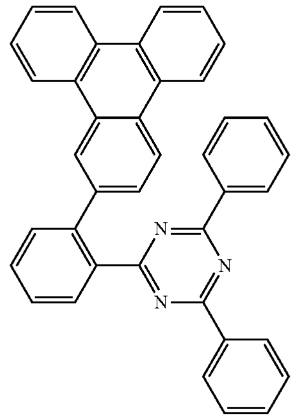
H-E32
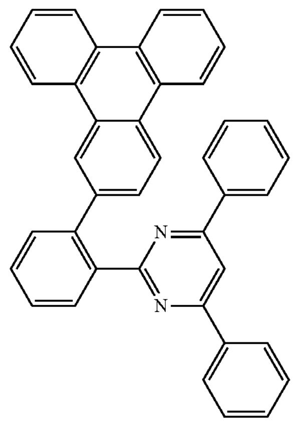
H-E33
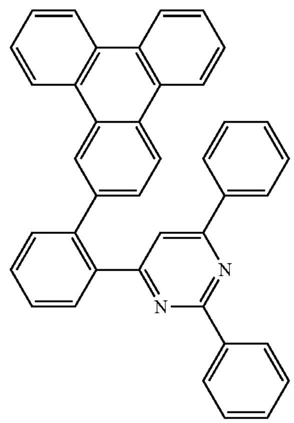
H-E34
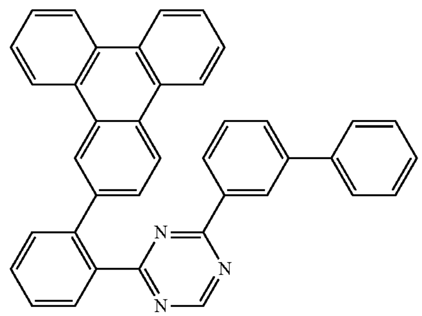

H-E35
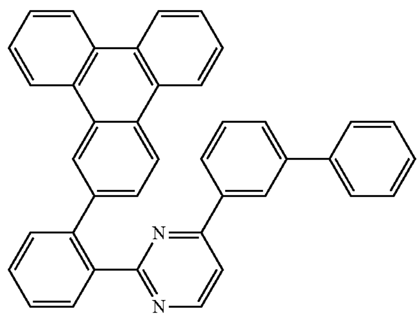
H-E36
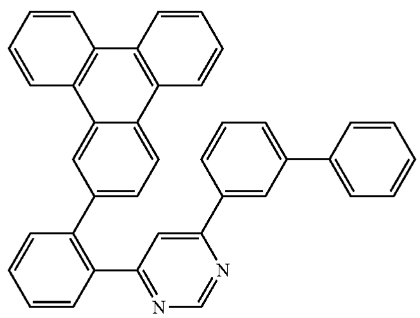
H-E37
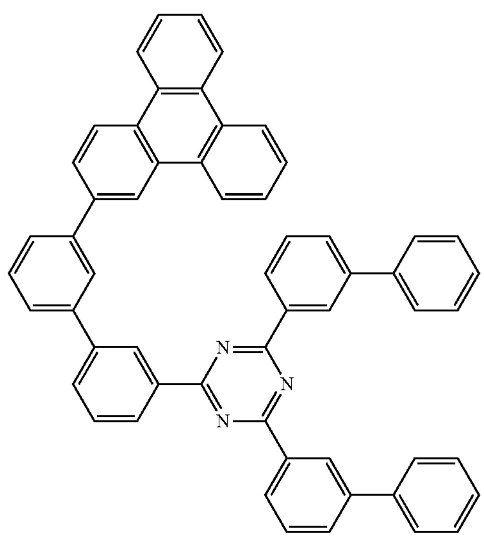
H-E38
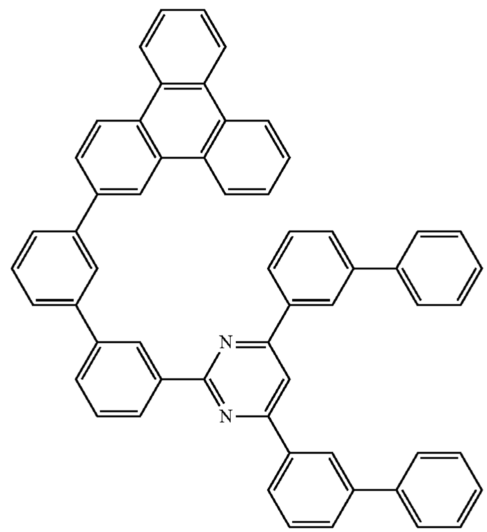
H-E39
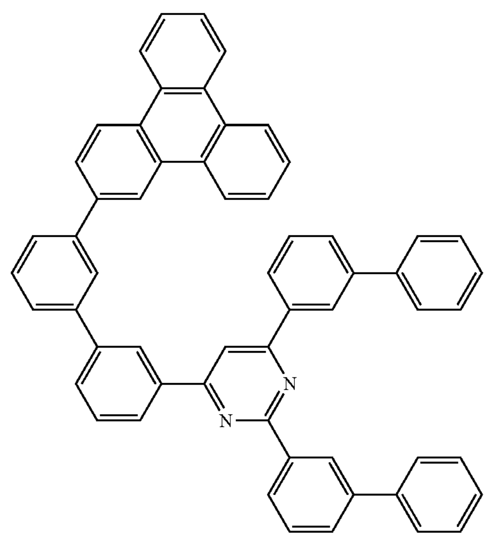
H-E40
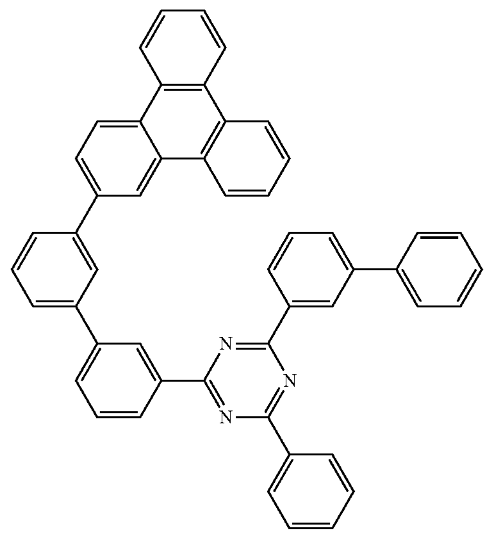

-continued
H-E41
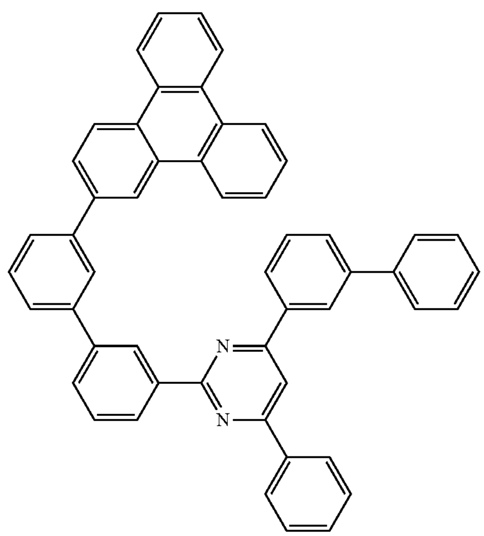
H-E42
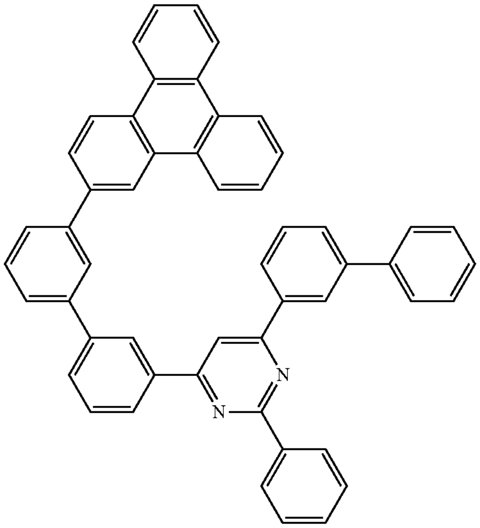
H-E43
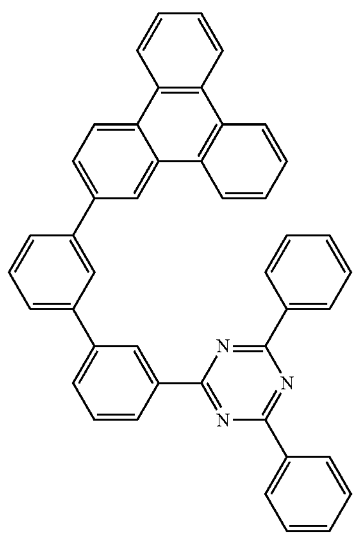
-continued
H-E44
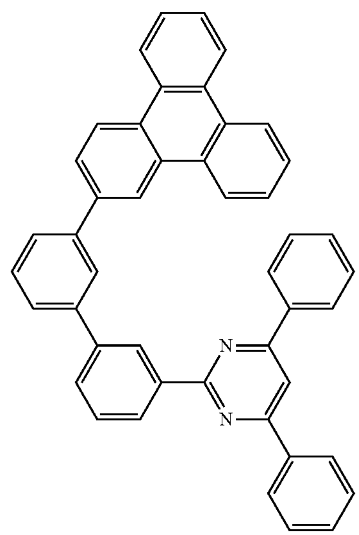
H-E45
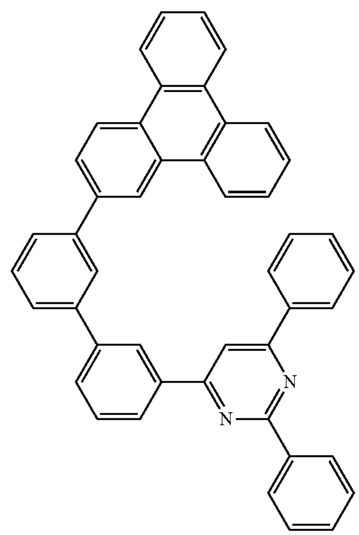
H-E46
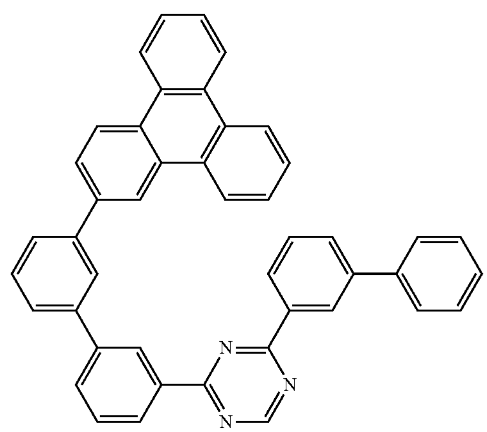

-continued
H-E47
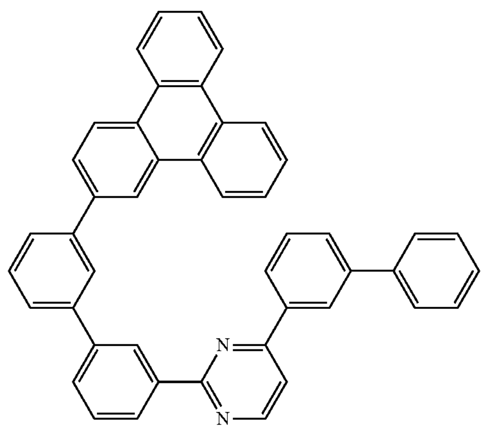
H-E48
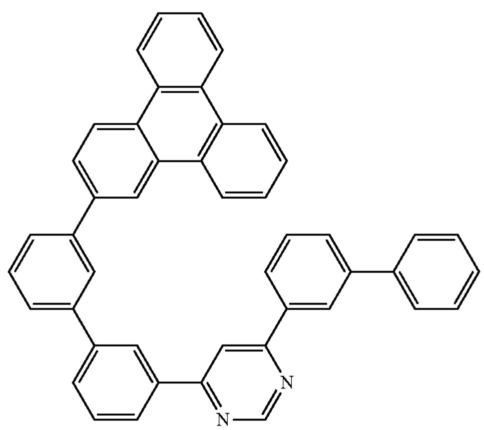
H-E49
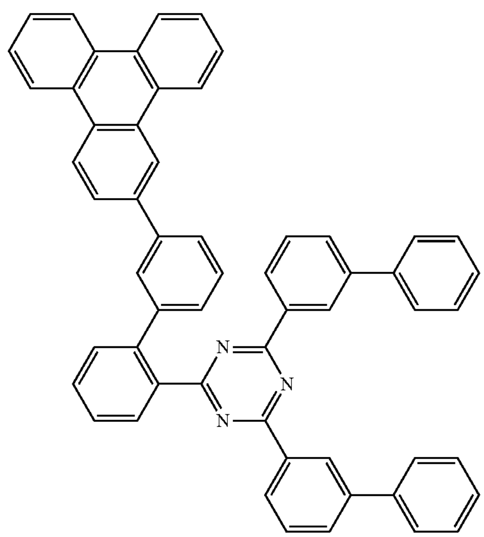
-continued
H-E50
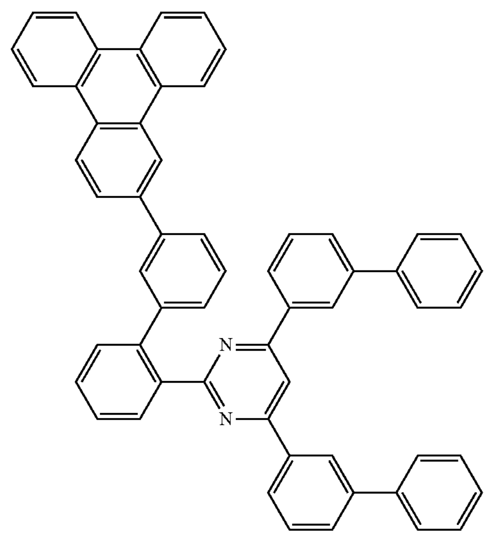
H-E51
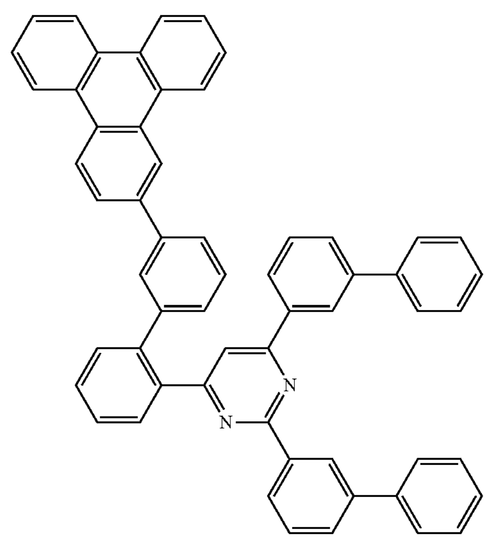
H-E52
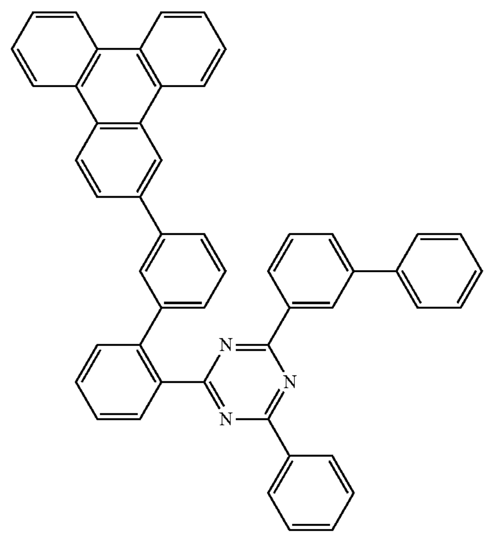

H-E53
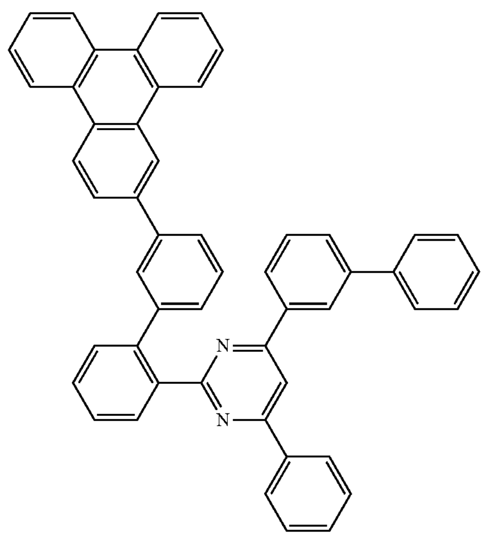
H-E54
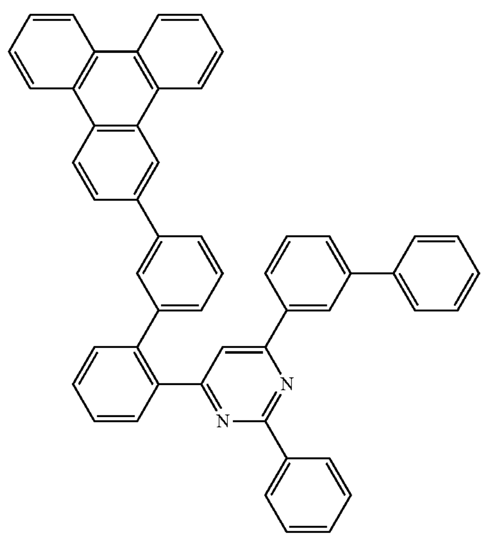
H-E55
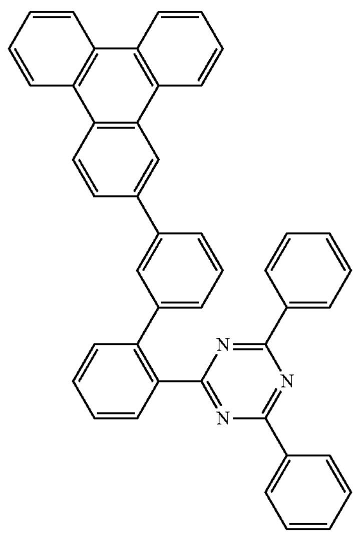
H-E56
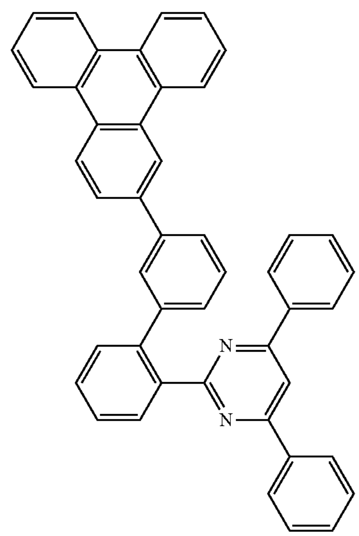
H-E57
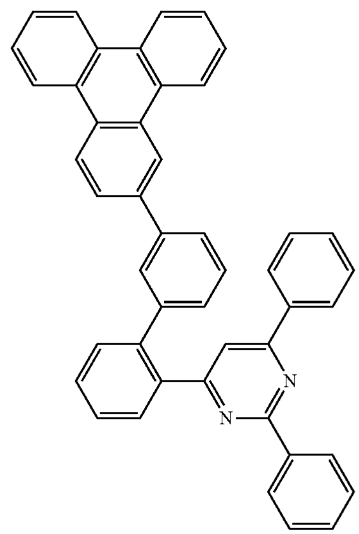
H-E58
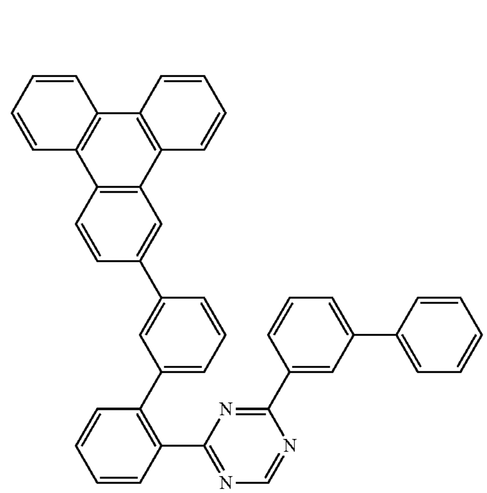

-continued
H-E59
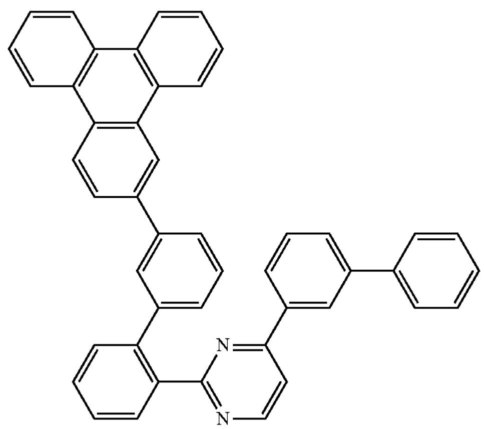
H-E60
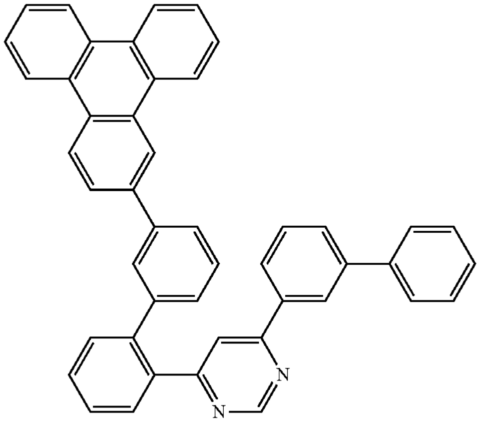
H-E61
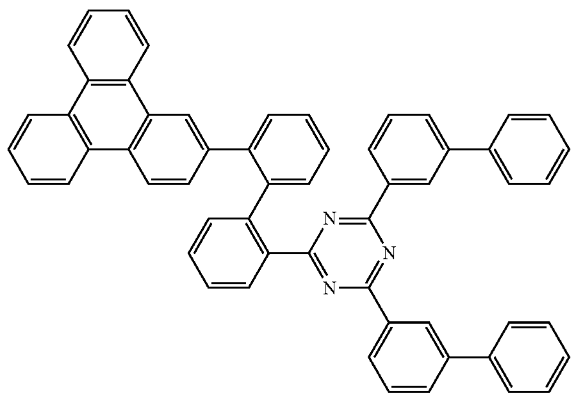
-continued
H-E62
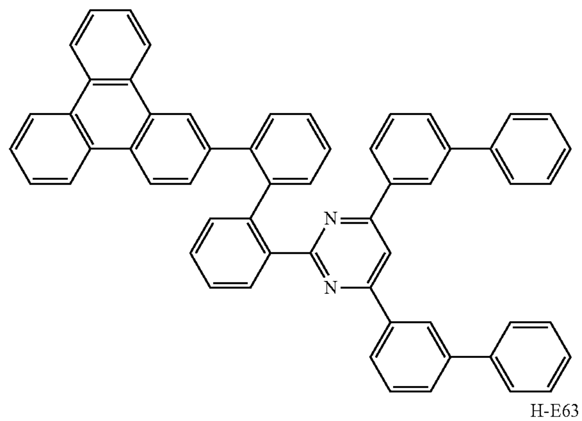
H-E63
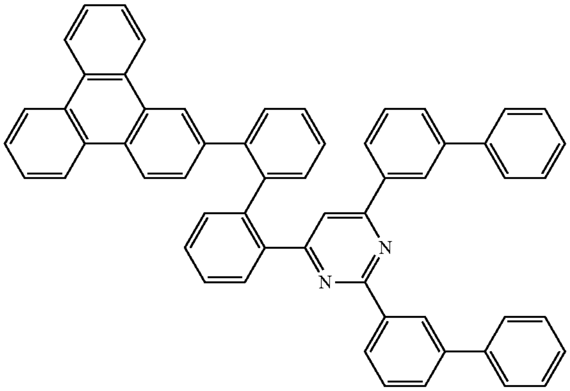
H-E64
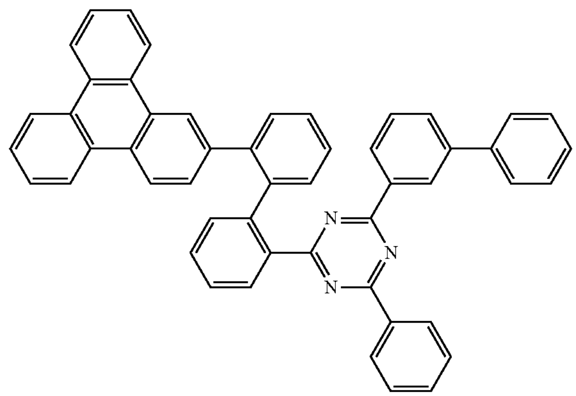
H-E65
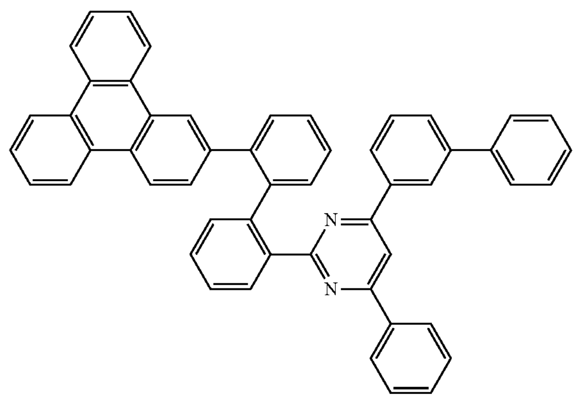

-continued
H-E66
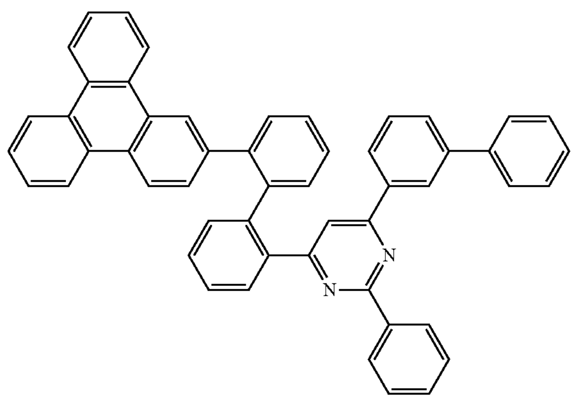
H-E67
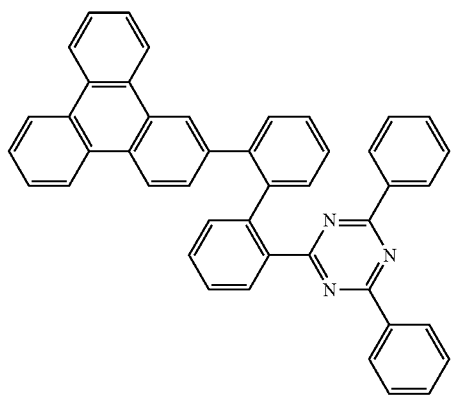
H-E68
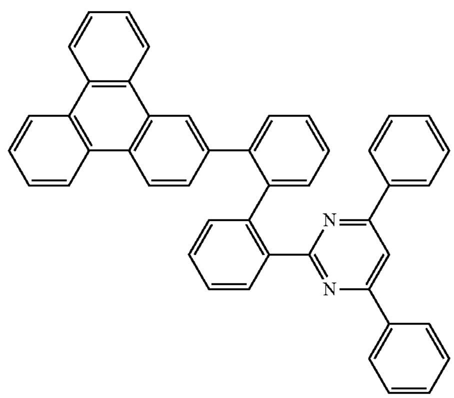
H-E69
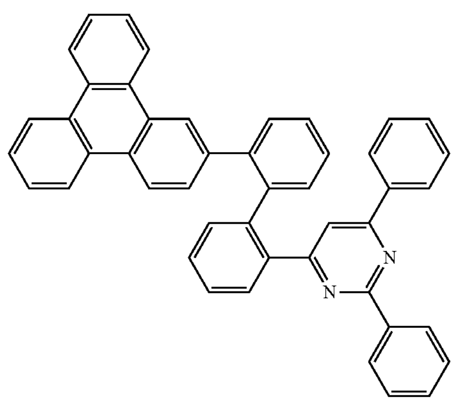
-continued
H-E70
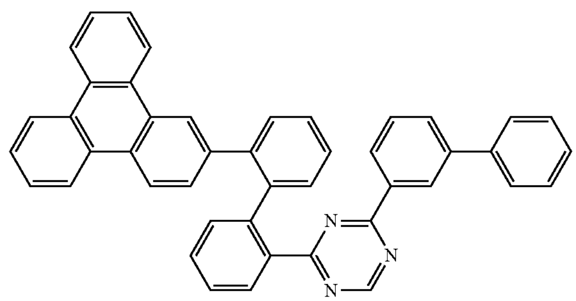
H-E71
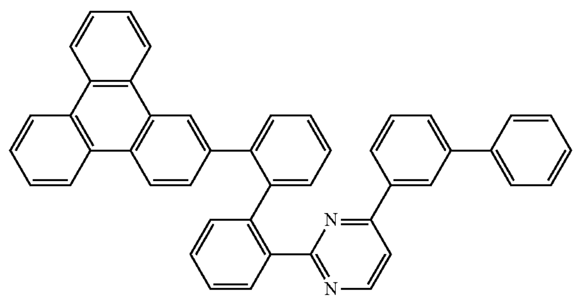
H-E72
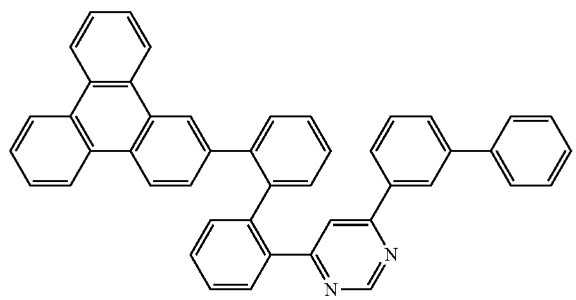
H-E73
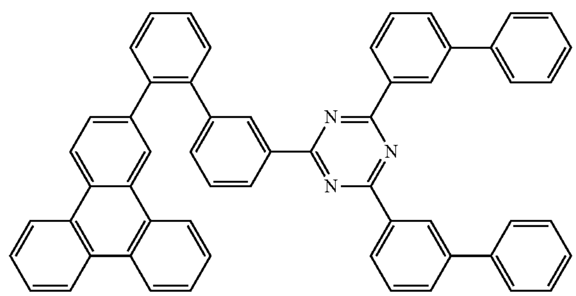
H-E74
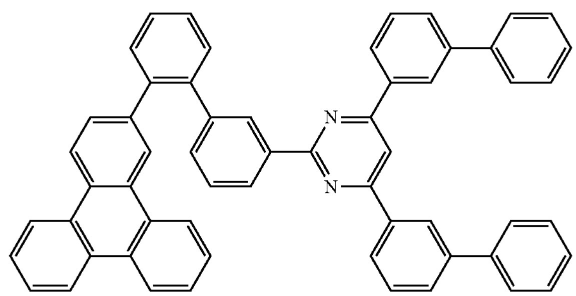

-continued
H-E75
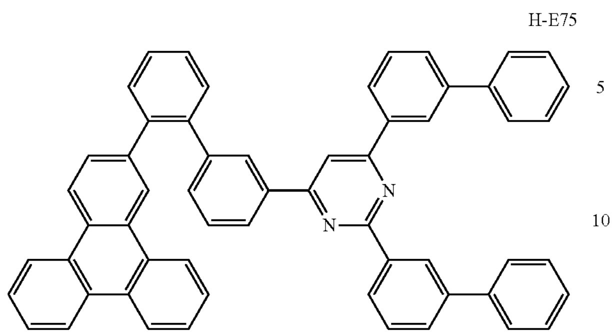
H-E76
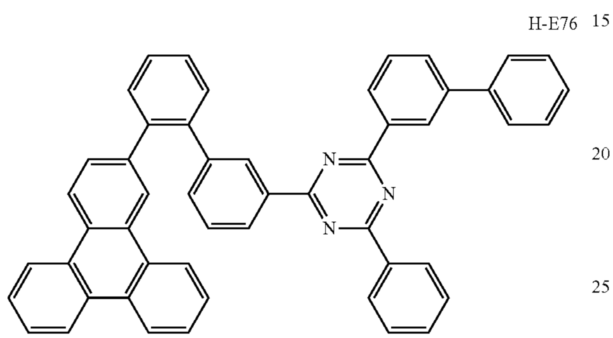
H-E77
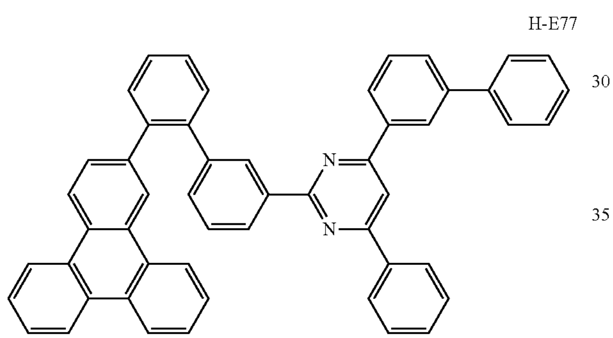
H-E78
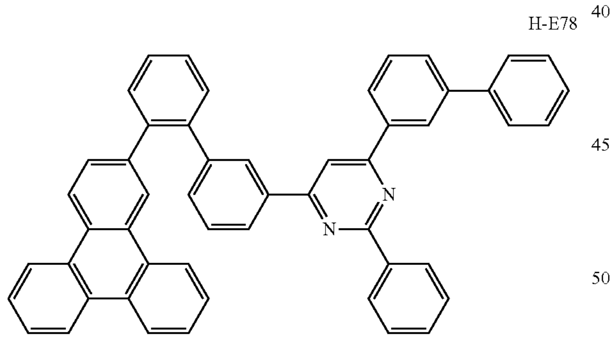
H-E79
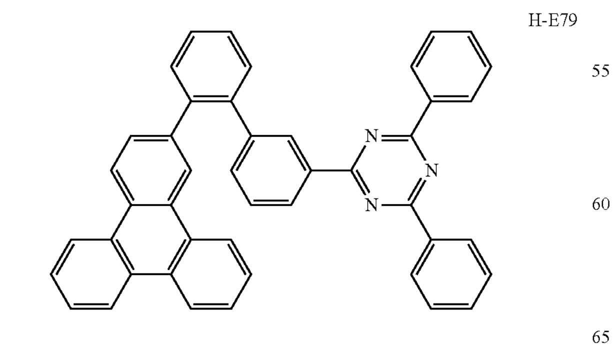
-continued
H-E80
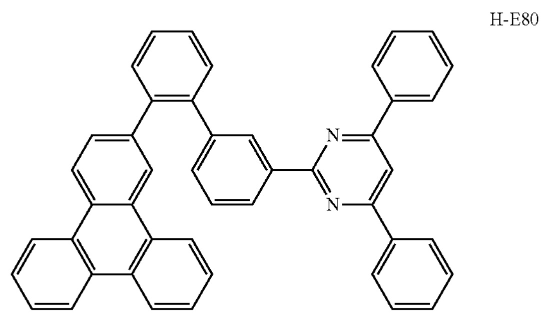
H-E81
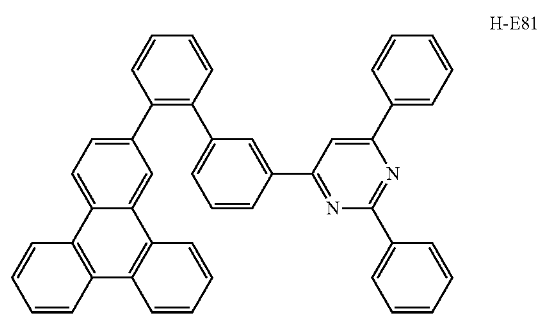
H-E82
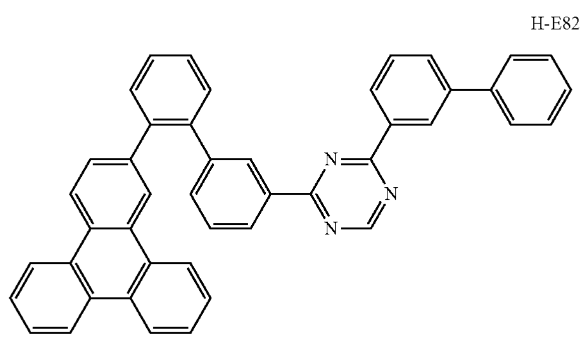
H-E83
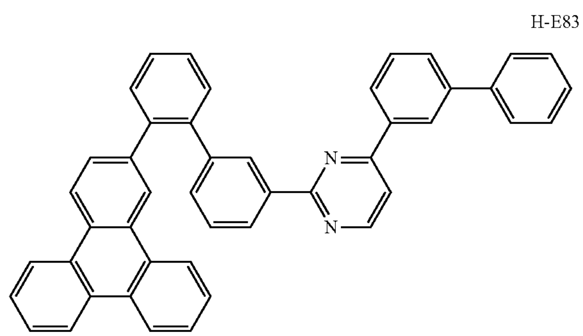
H-E84
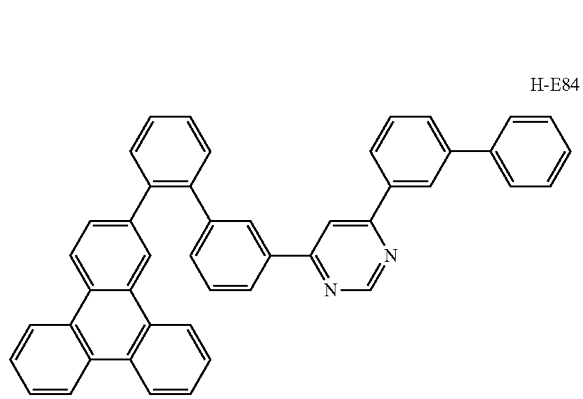

-continued
H-E(1)
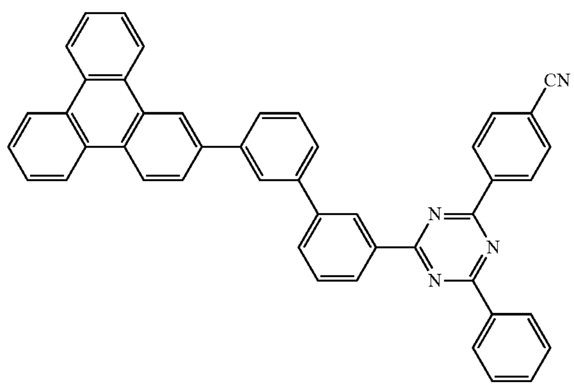
H-E(2)
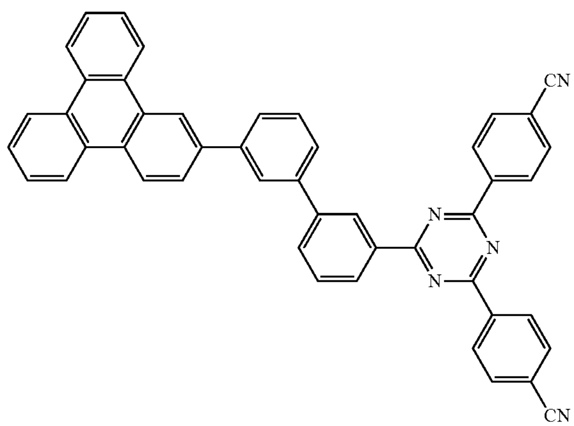
H-E(3)
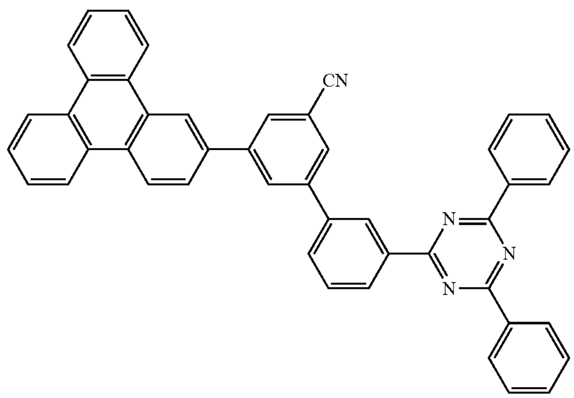
-continued
H-E(4)
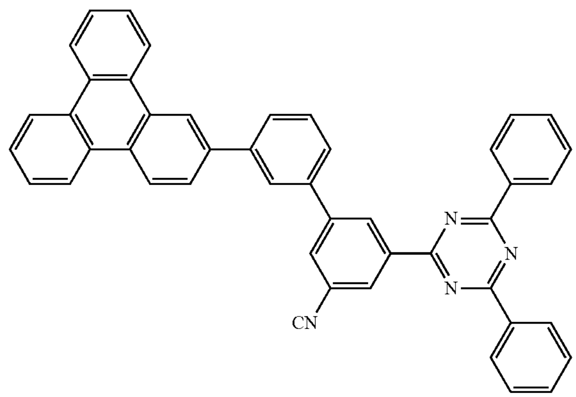
A-1
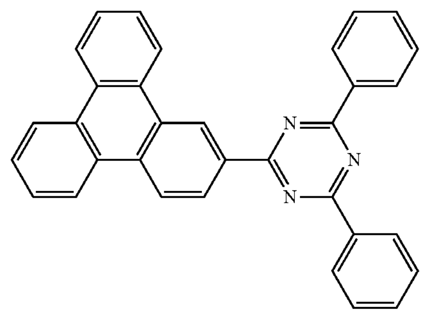
A-2
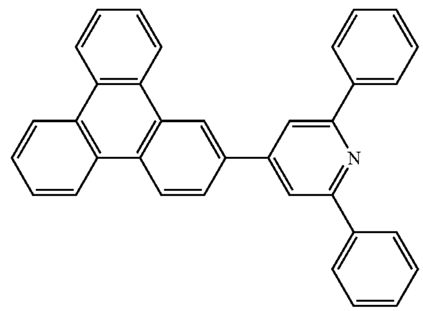
A-3
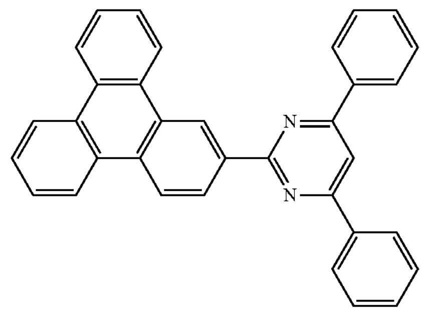

-continued
A-4
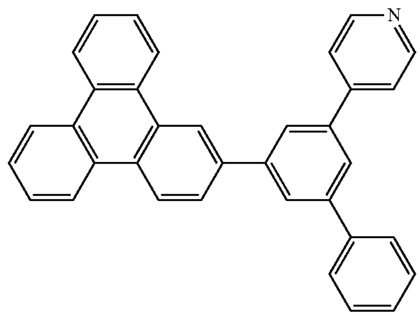
A-5
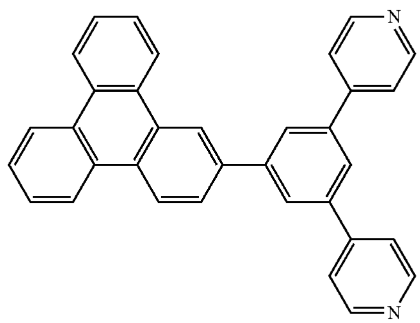
A-6
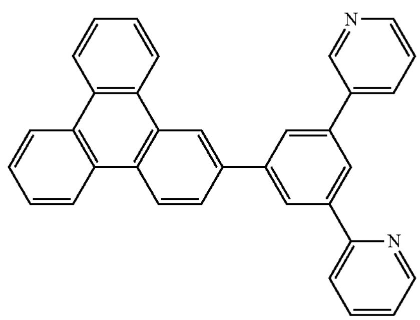
A-7
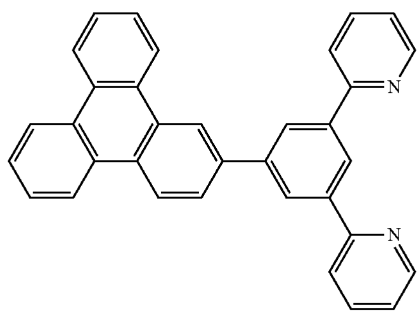
A-8
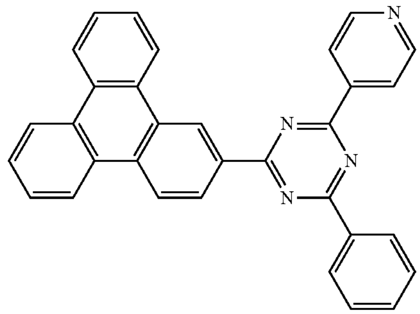
-continued
A-9
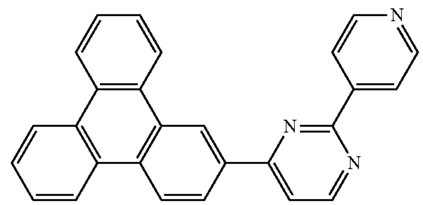
A-10
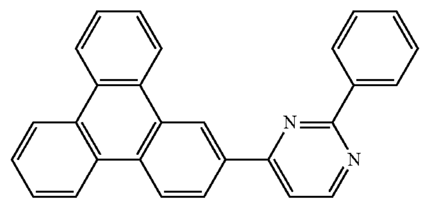
A-11
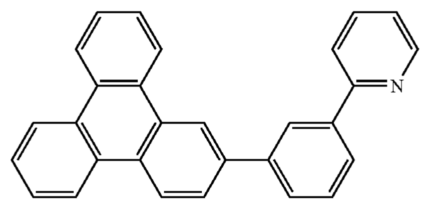
A-12
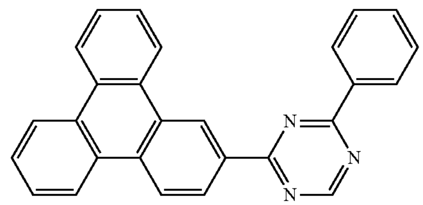
A-13
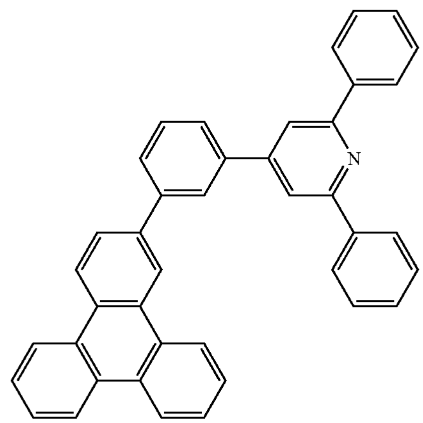

-continued
A-14
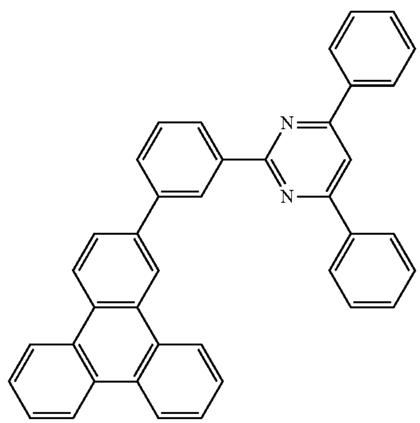
A-15
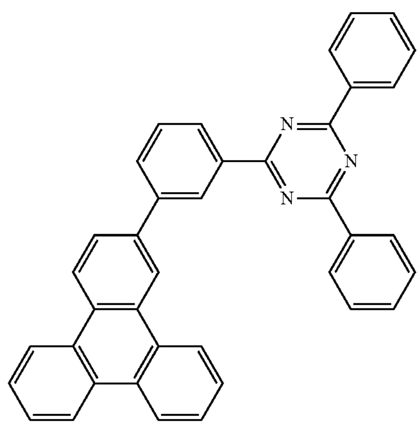
A-16
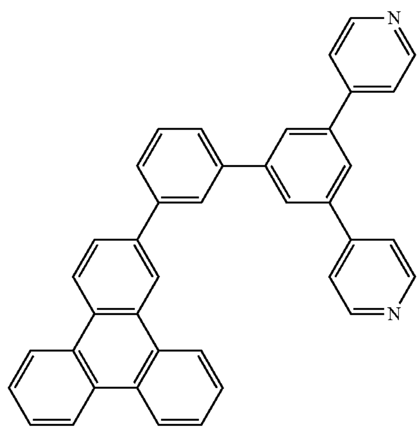
-continued
A-17
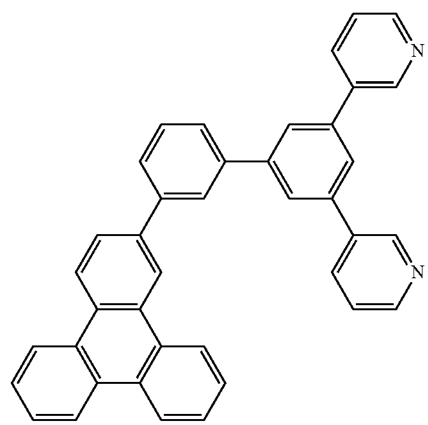
A-18
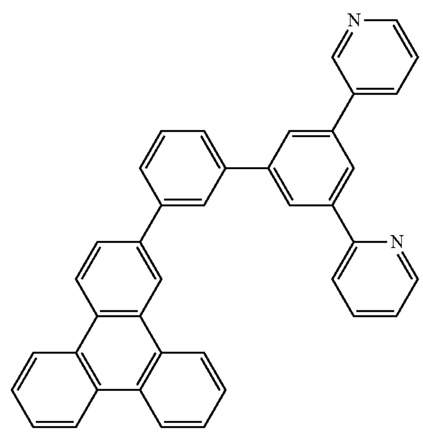
A-19
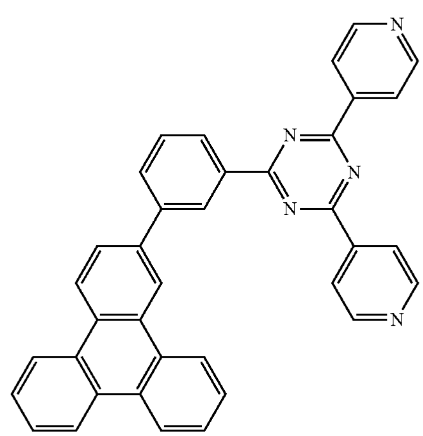

-continued
A-20
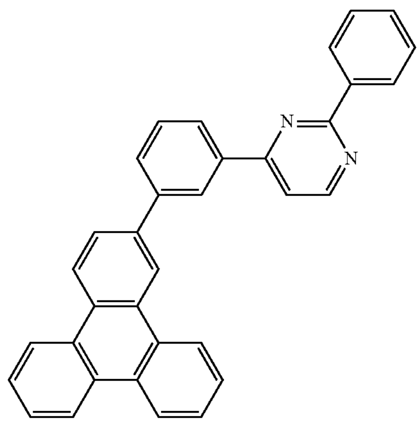
A-21
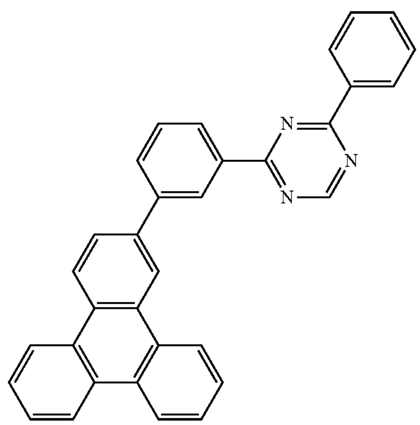
A-22
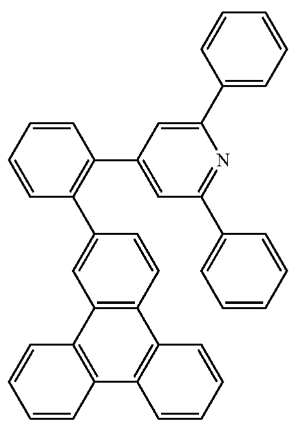
-continued
A-23
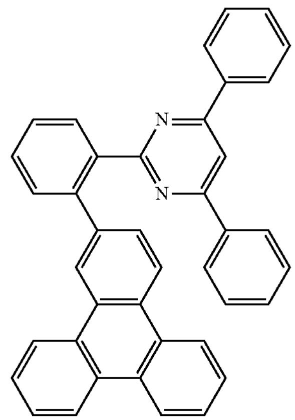
A-24
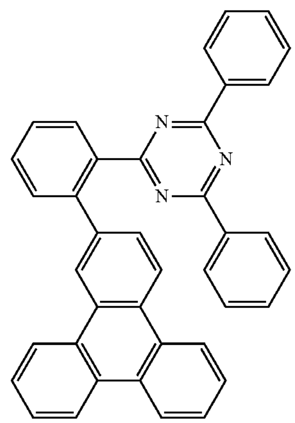
A-25
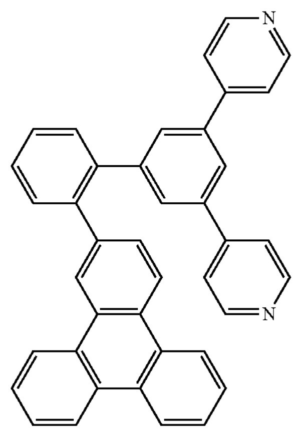

-continued
A-26
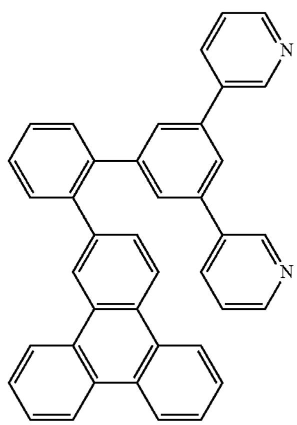
A-27
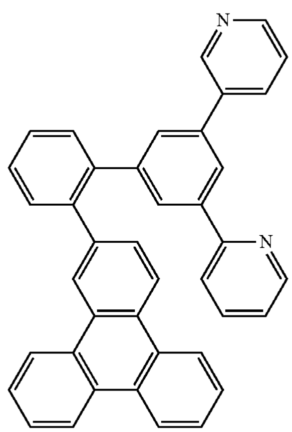
A-28
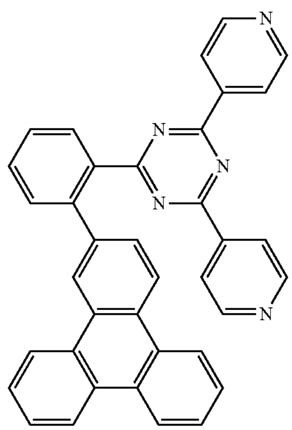
-continued
A-29
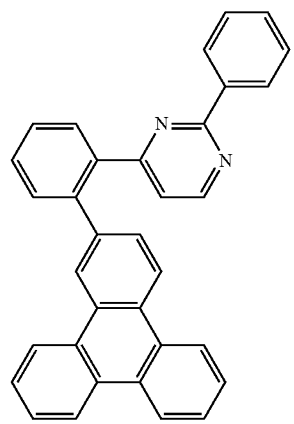
A-30
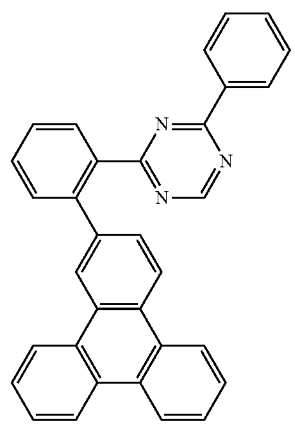
A-31
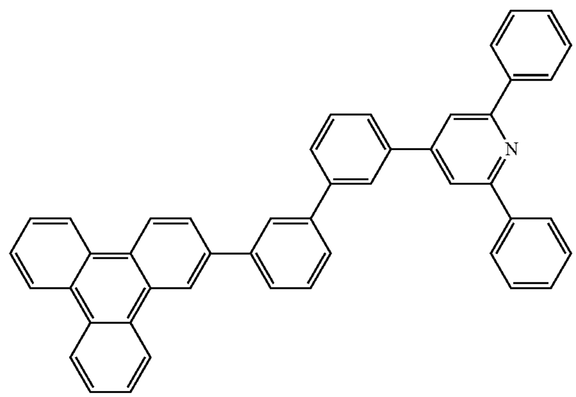

-continued
A-32
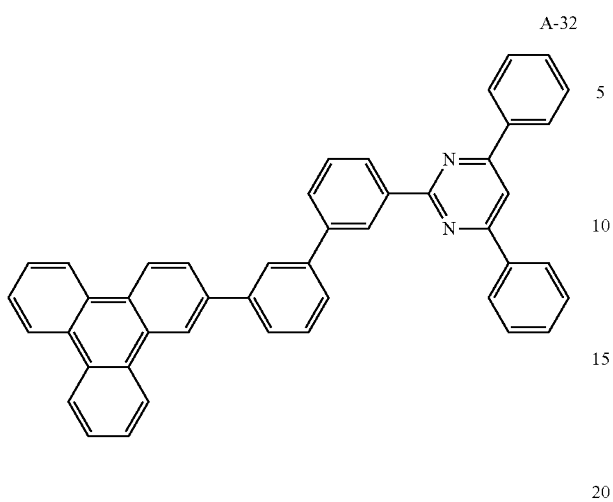
A-33
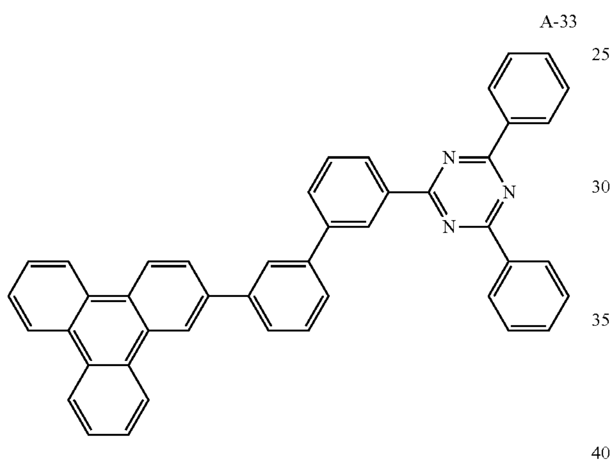
A-34
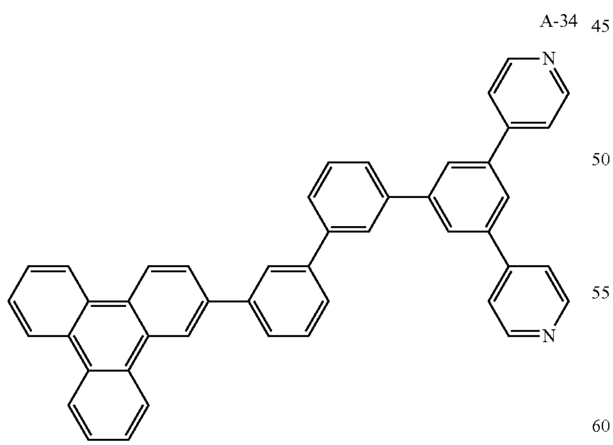
-continued
A-35
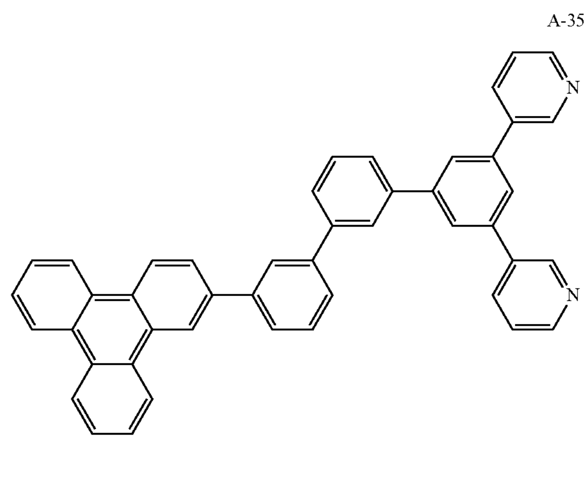
A-36
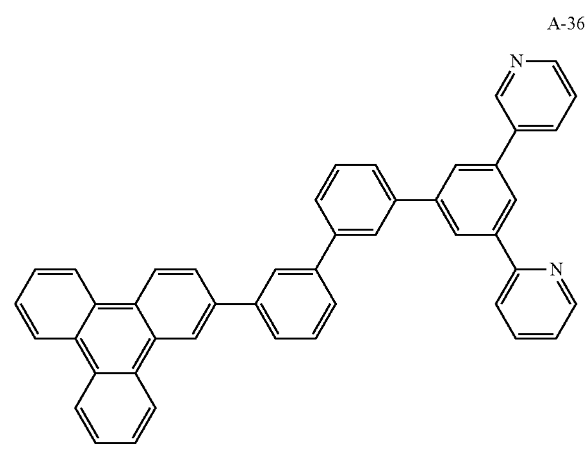
A-37
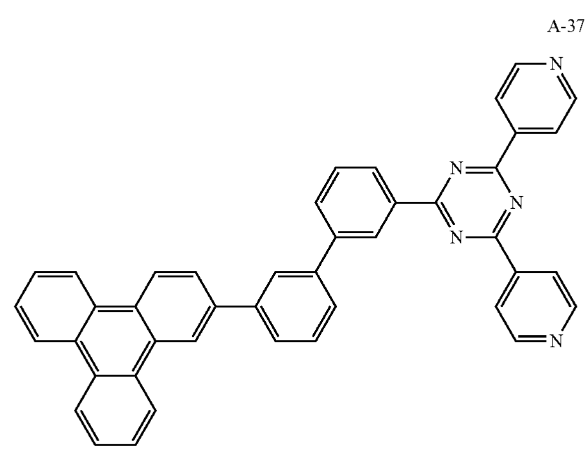

-continued
A-38
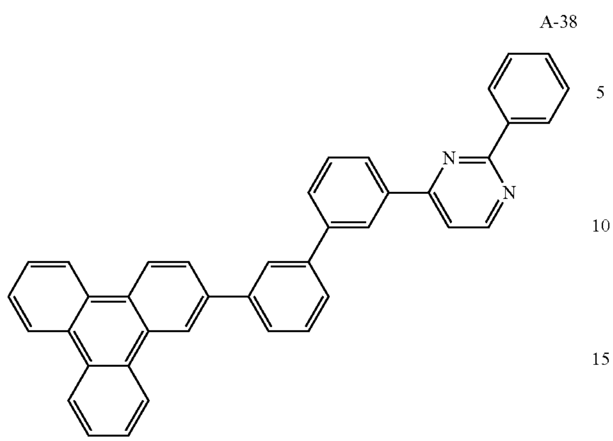
A-39
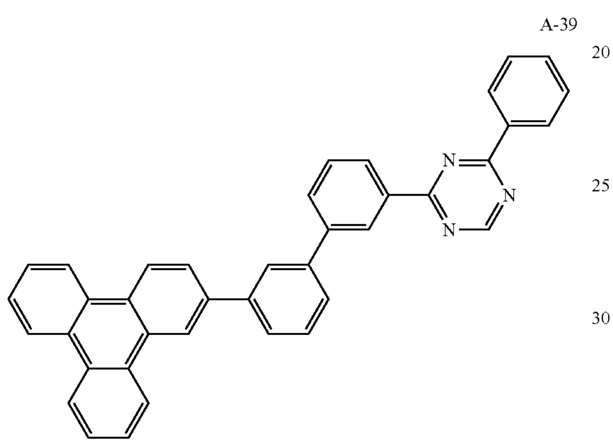
A-40
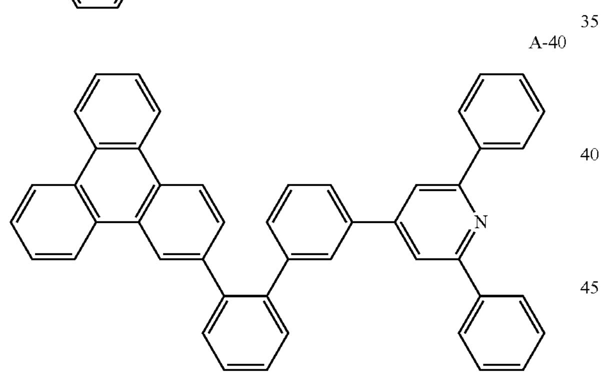
A-41
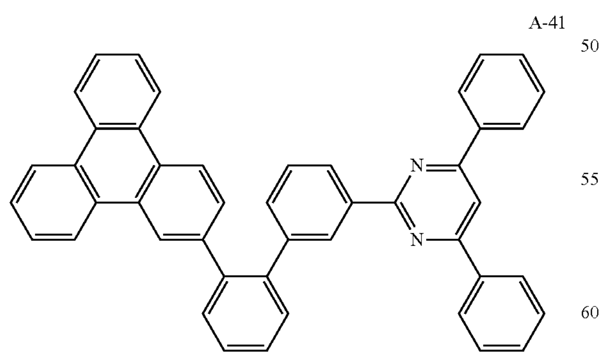
-continued
A-42
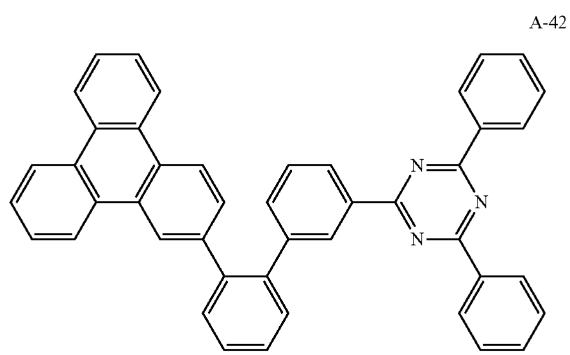
A-43
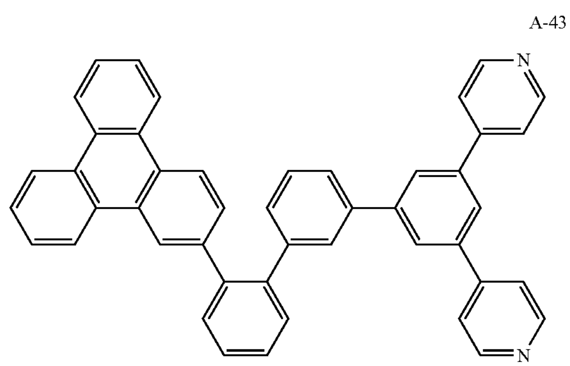
A-44
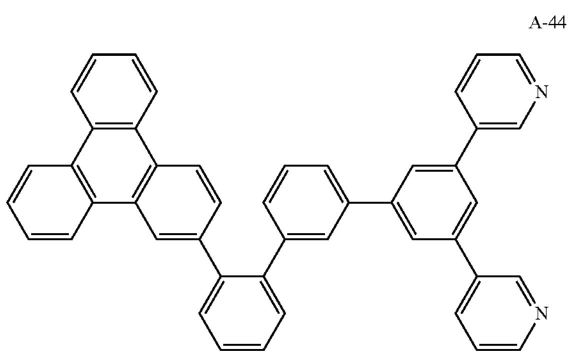
A-45
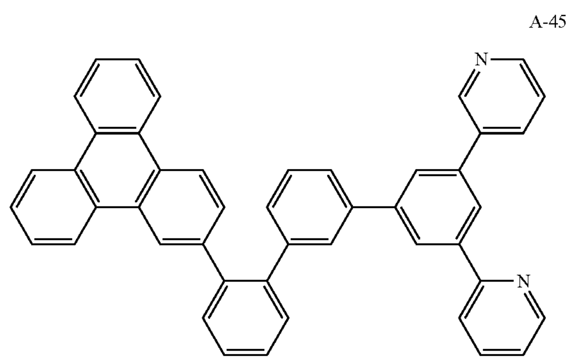

-continued
A-46
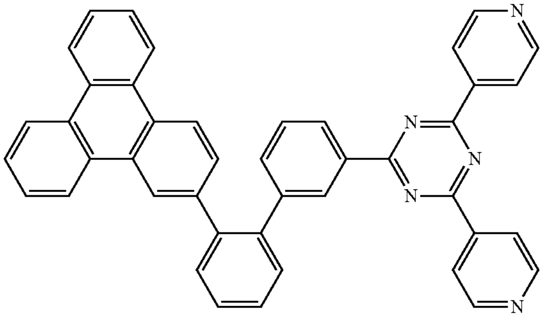
A-47
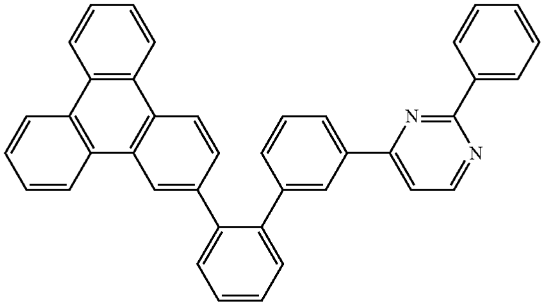
A-48
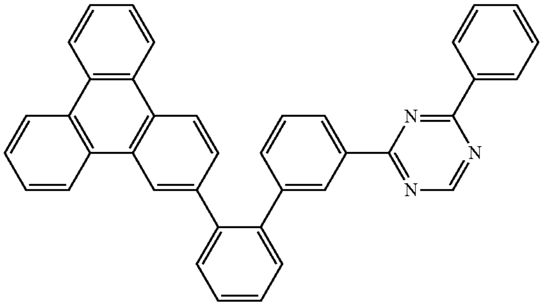
A-48
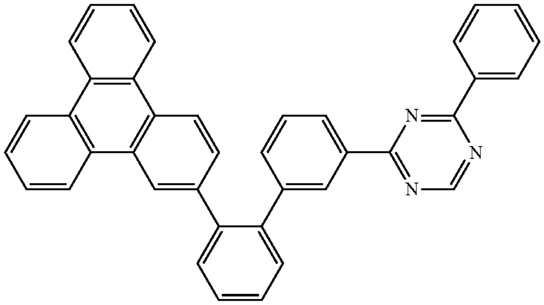
-continued
A-49
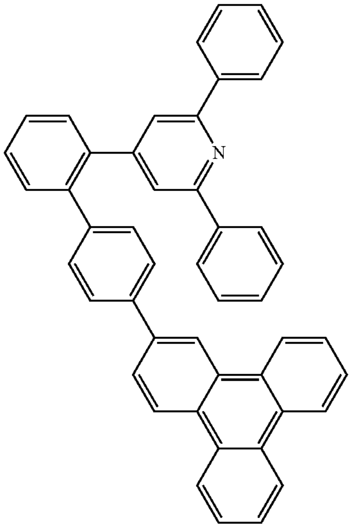
A-50
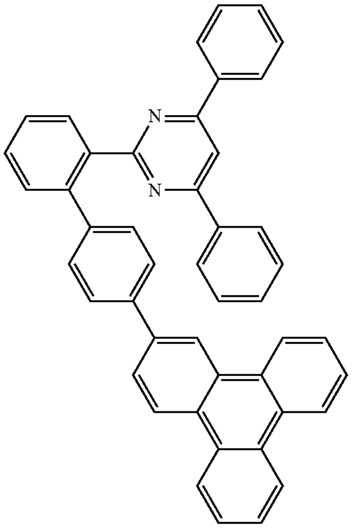
A-51
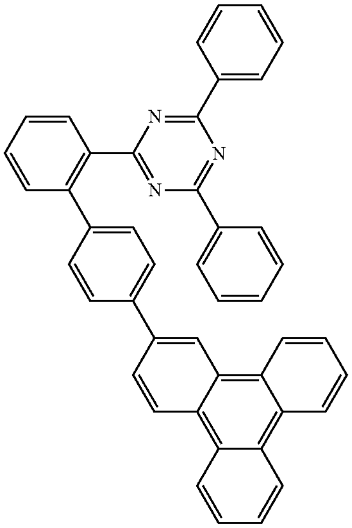

-continued
A-52
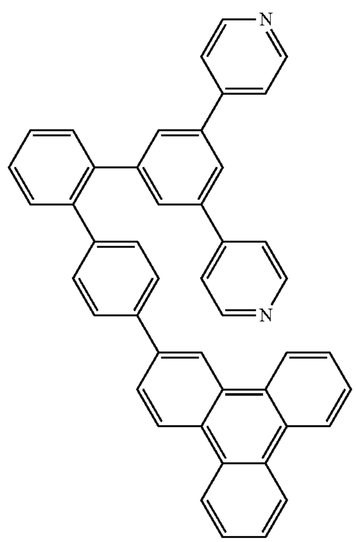
A-53
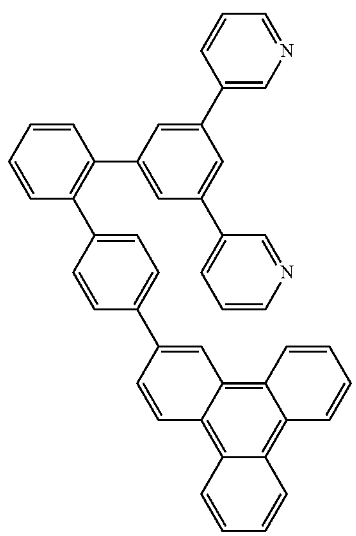
A-54
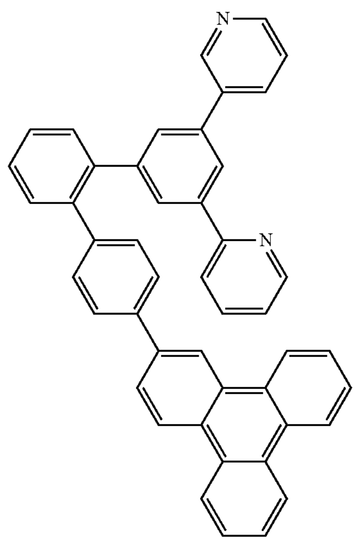
-continued
A-55
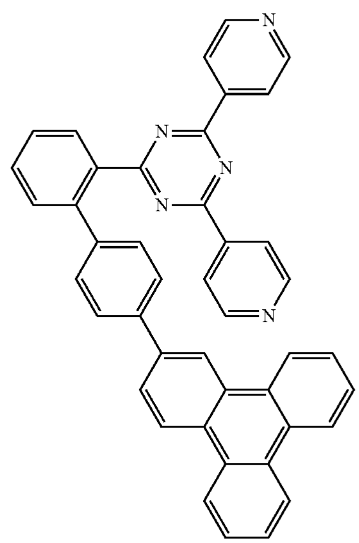
A-56
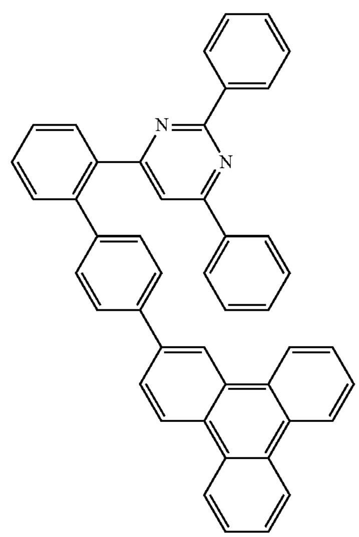
A-57
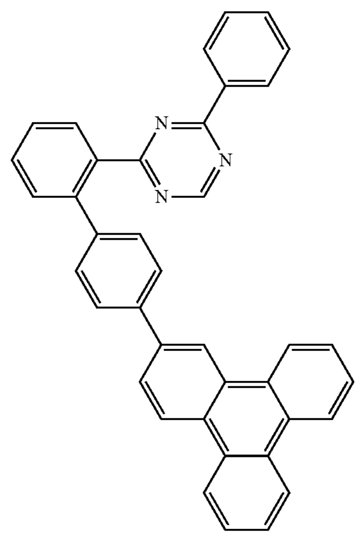

-continued
A-58
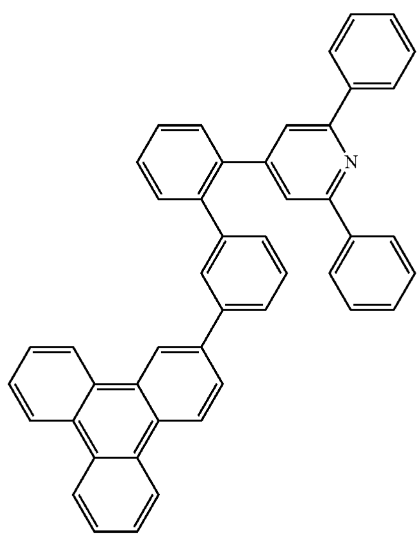
A-59
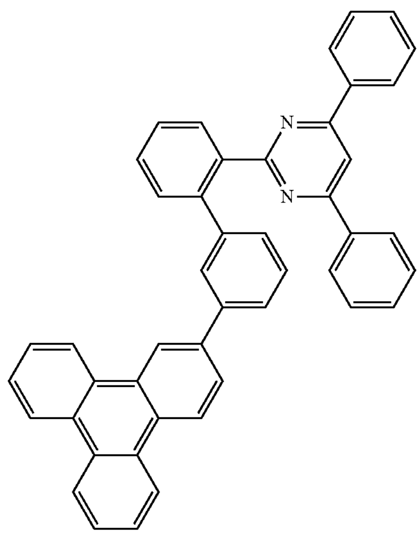
A-60
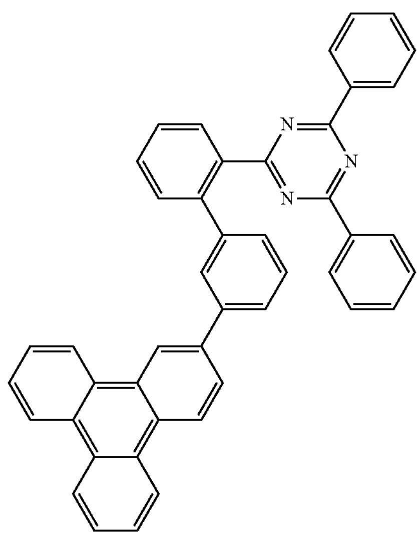
-continued
A-61
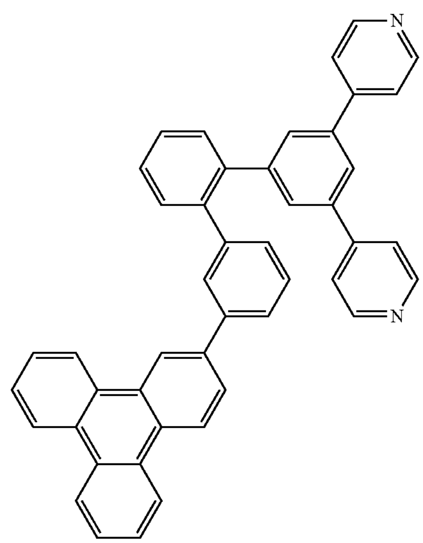
A-62
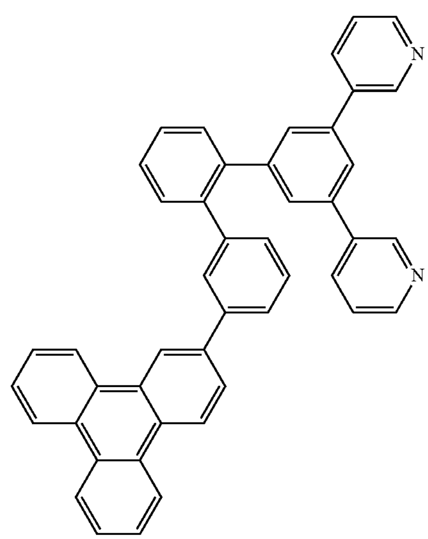
A-63
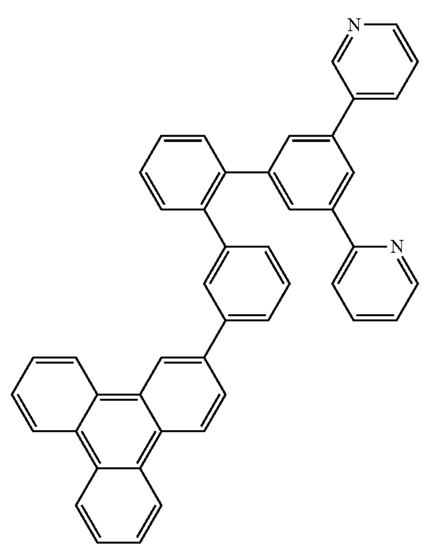

-continued
A-64
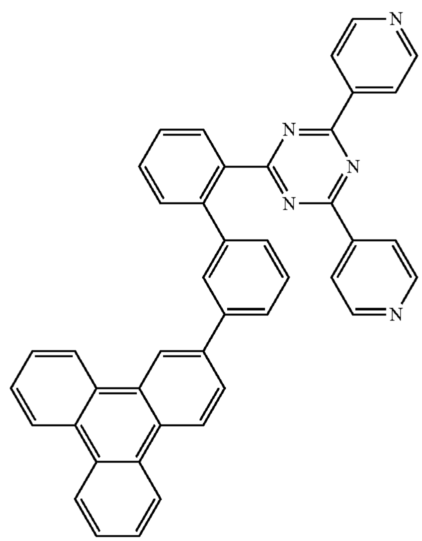
A-65
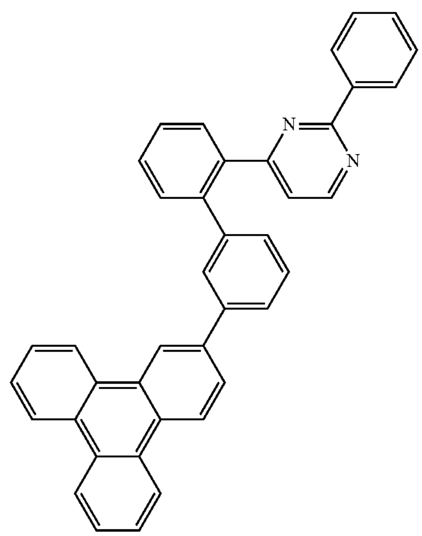
A-66
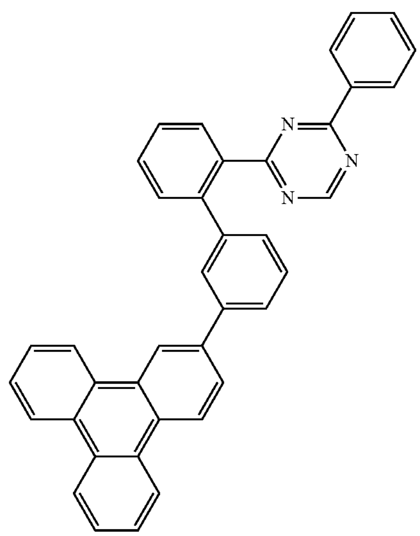
A-67
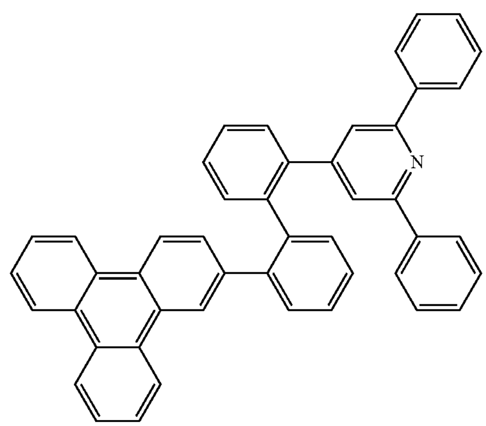
A-68
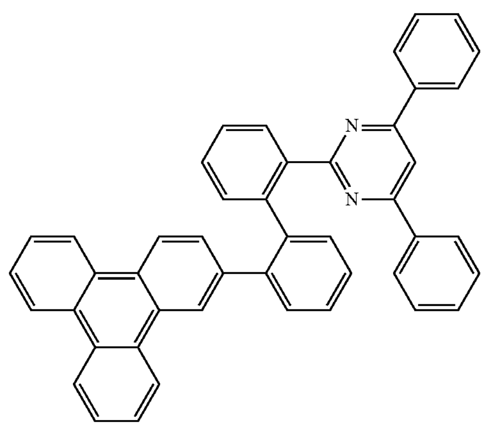

-continued
A-69
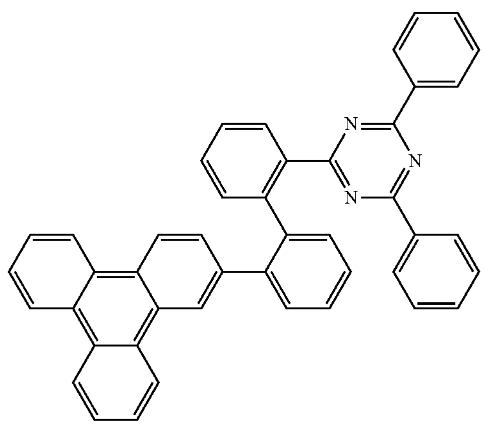
A-70
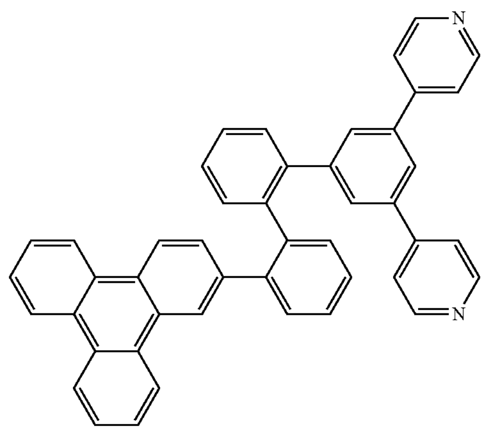
A-71
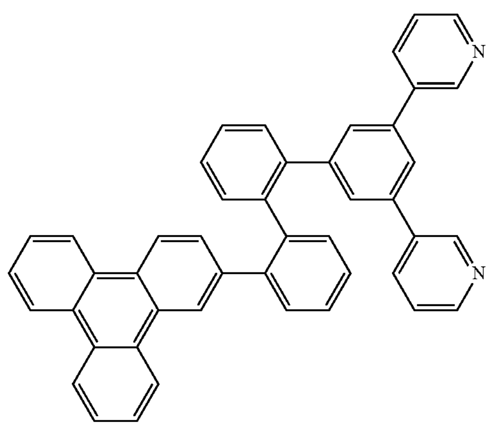
A-72
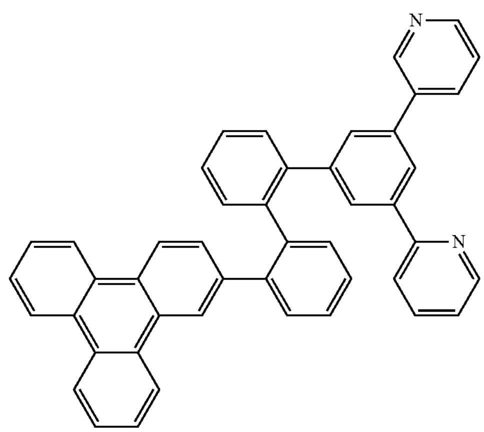
A-73
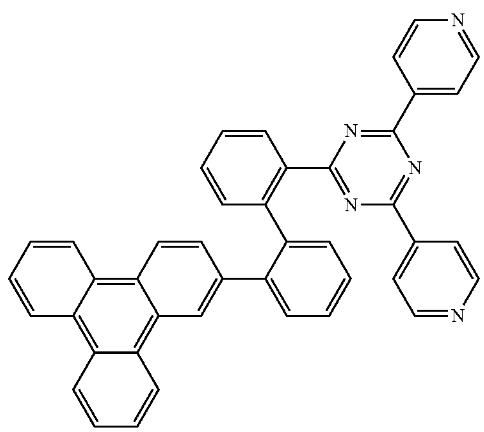
A-74
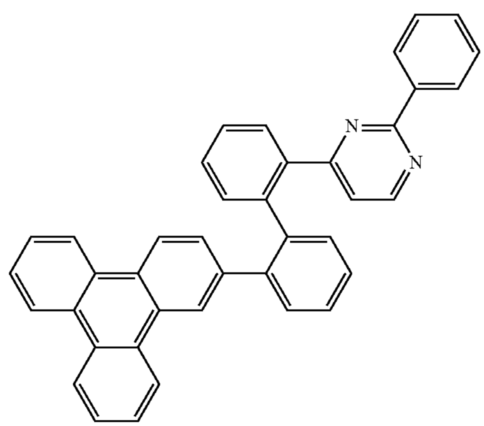

-continued
A-75
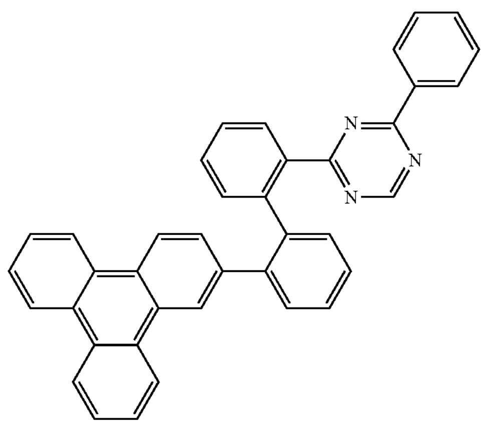
A-76
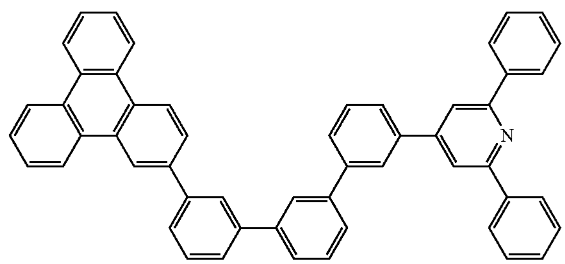
A-77
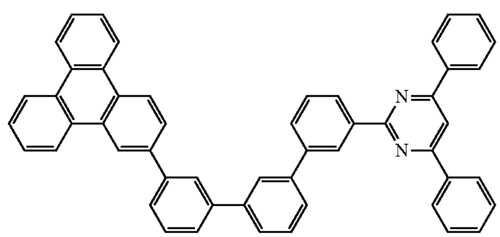
A-78
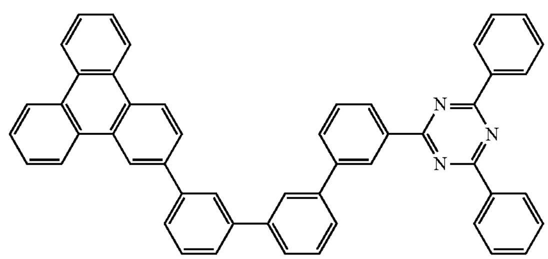
A-79
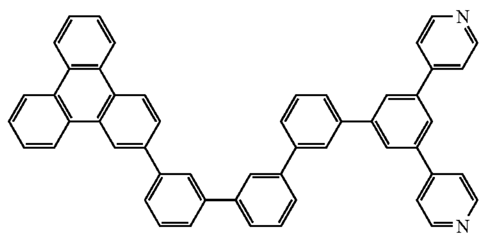
A-80
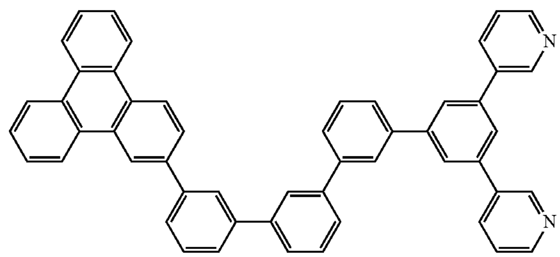
A-81
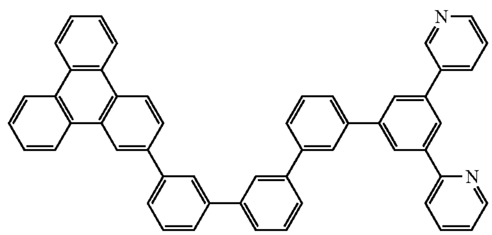
A-82
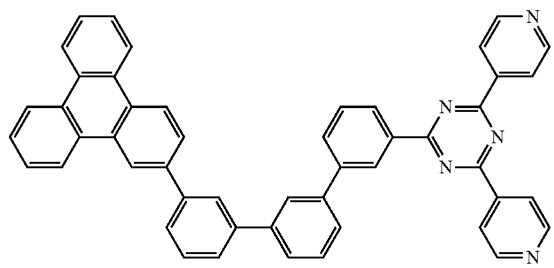
A-83
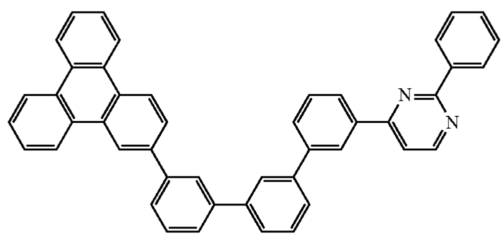
A-84
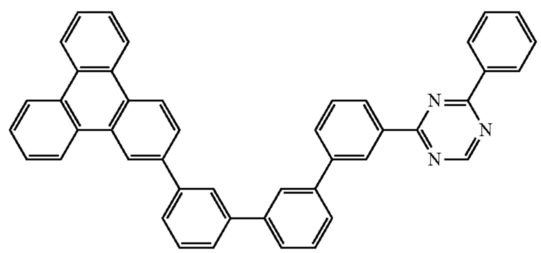

-continued
A-85
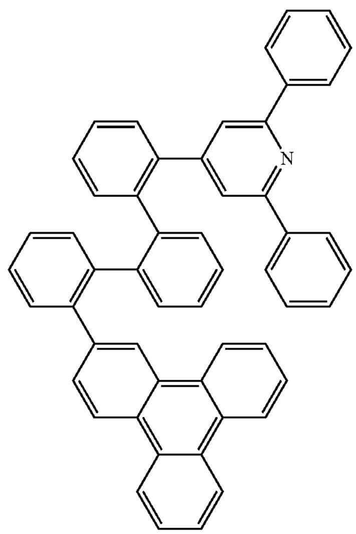
A-86
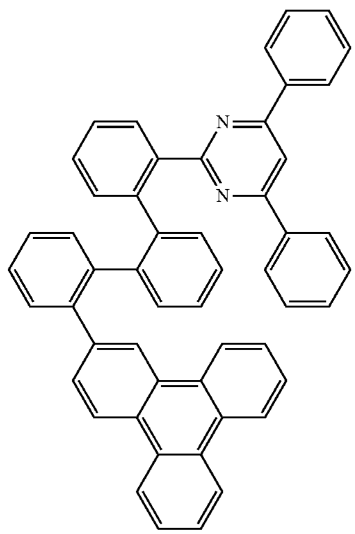
A-87
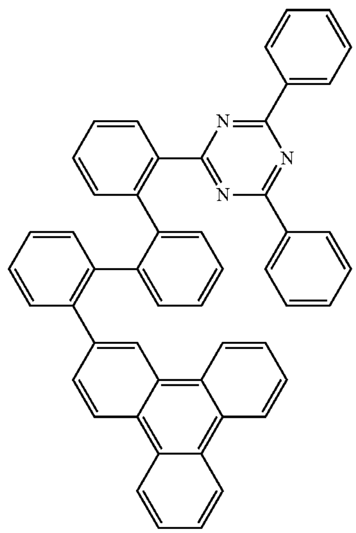
A-88
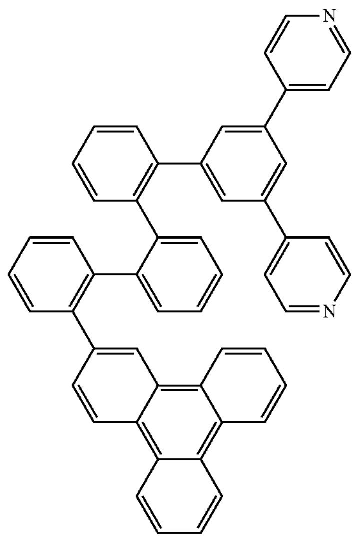
A-89
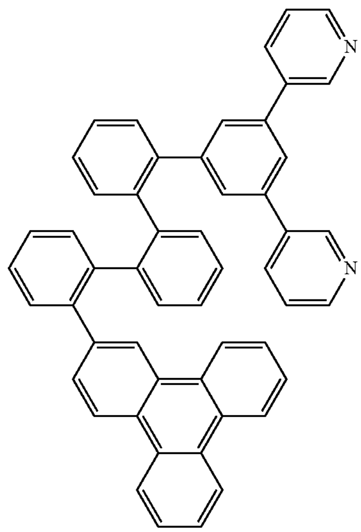
A-90
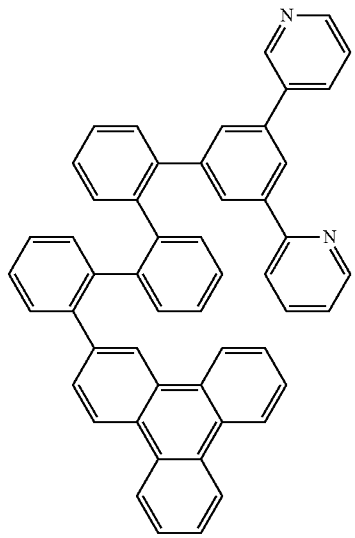

-continued
A-91
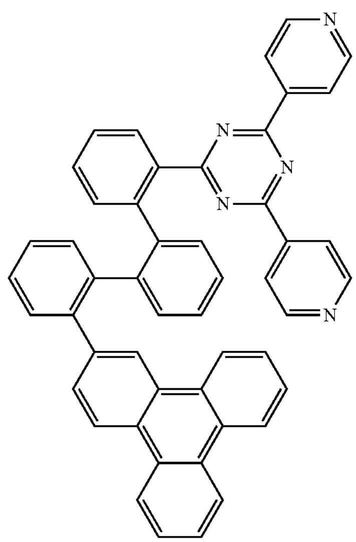
A-92
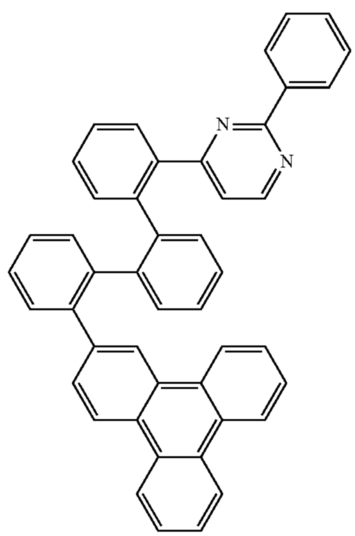
A-93
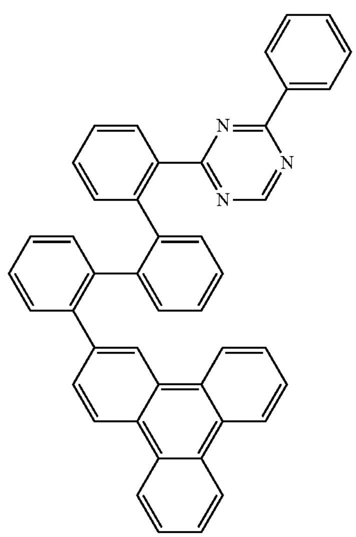
A-94
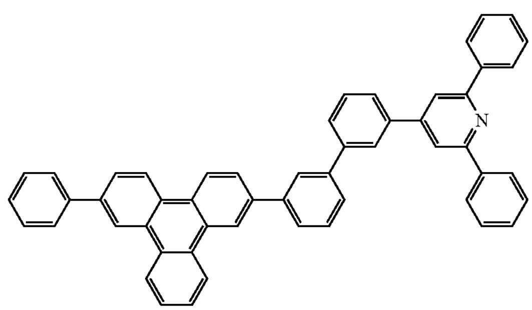
A-95
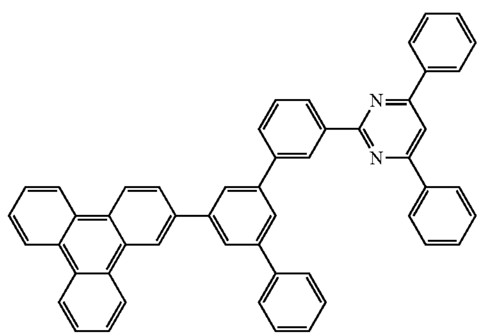
A-96
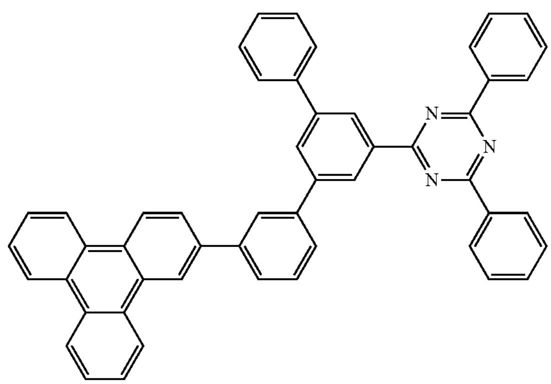

-continued
A-97
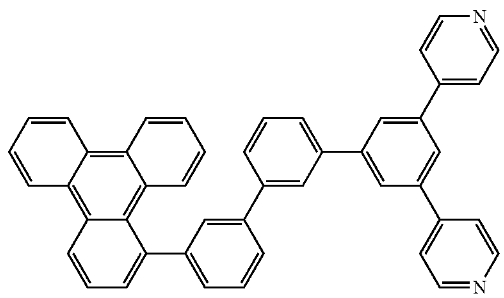
A-98
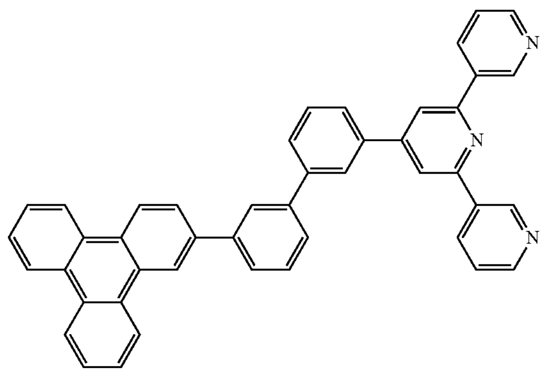
A-99
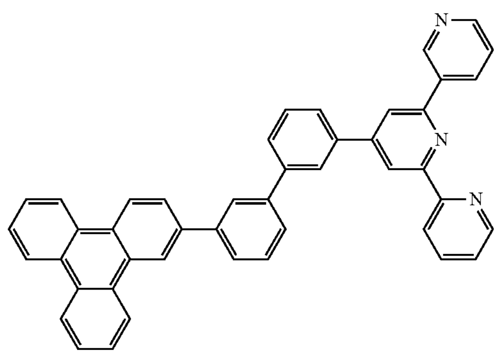
A-100
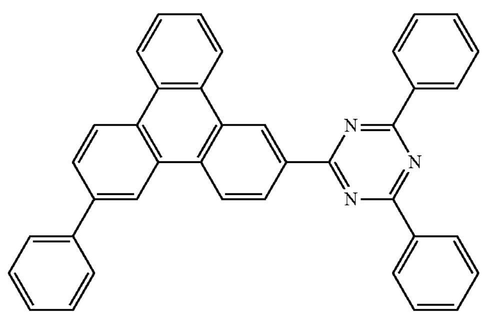
A-101
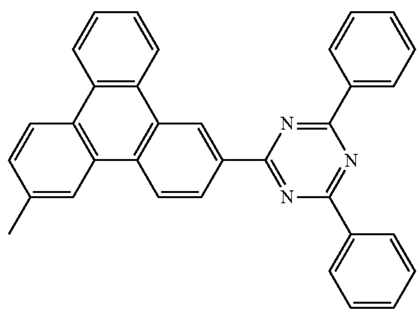
A-102
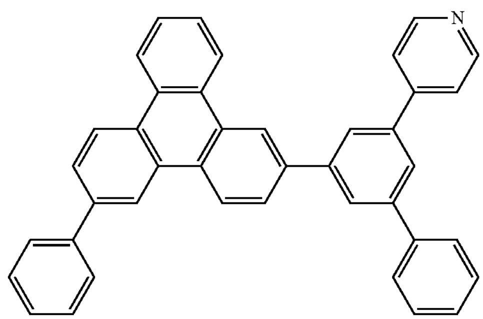
A-103
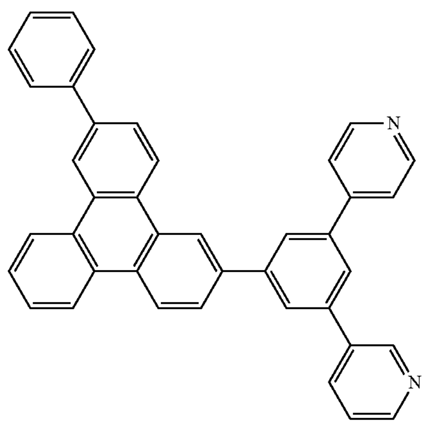
A-104
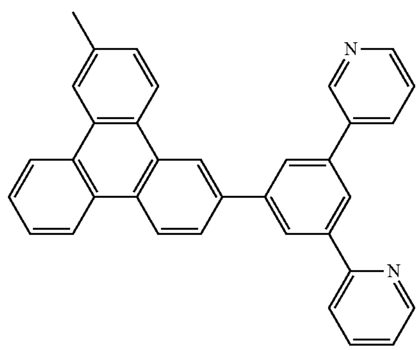

-continued
A-105
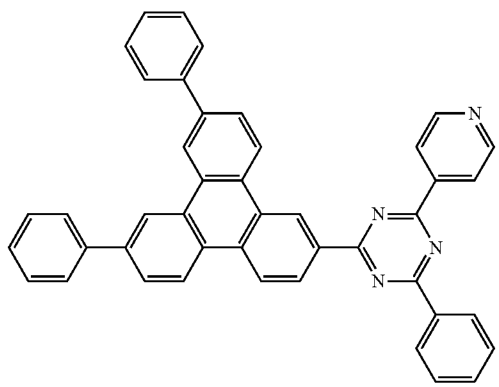
A-106
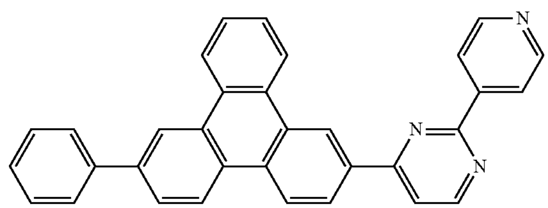
A-107
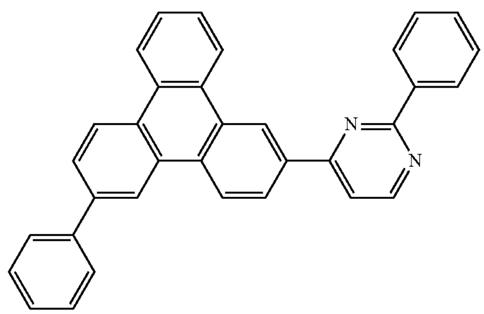
A-108
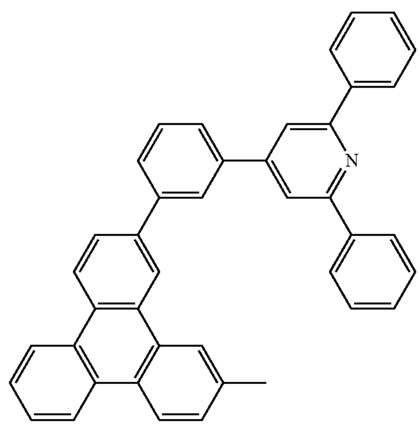
A-109
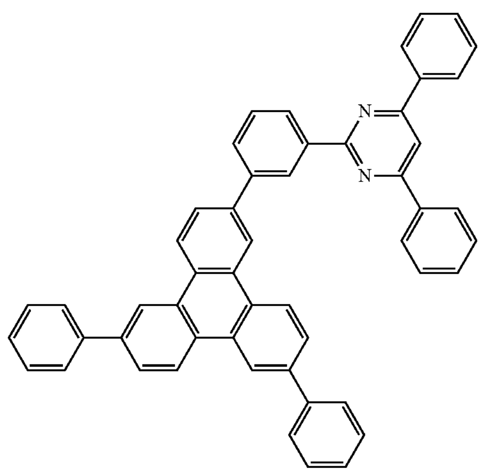
A-110
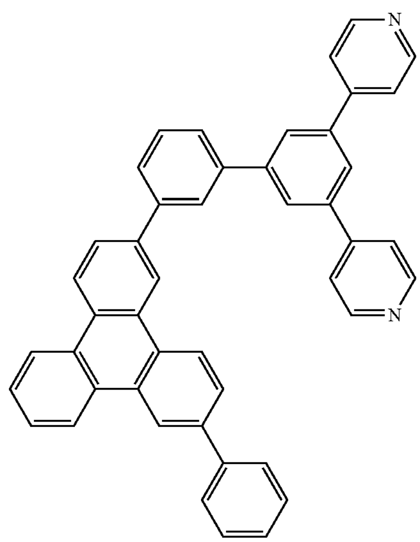

-continued
A-111
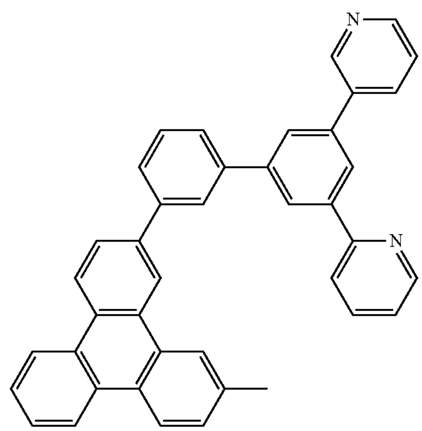
A-112
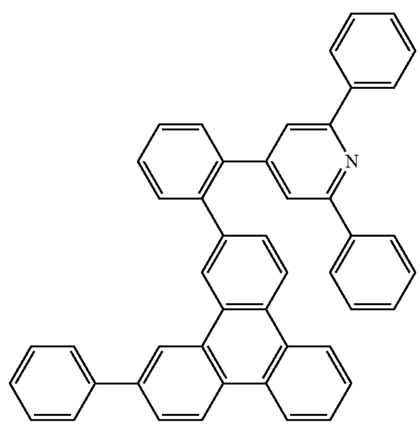
A-113
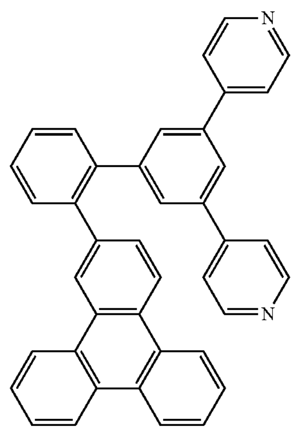
A-114
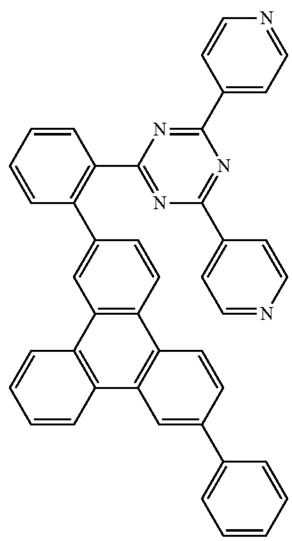
A-115
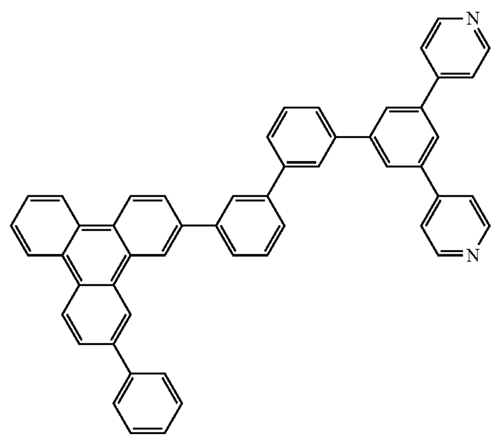
A-116
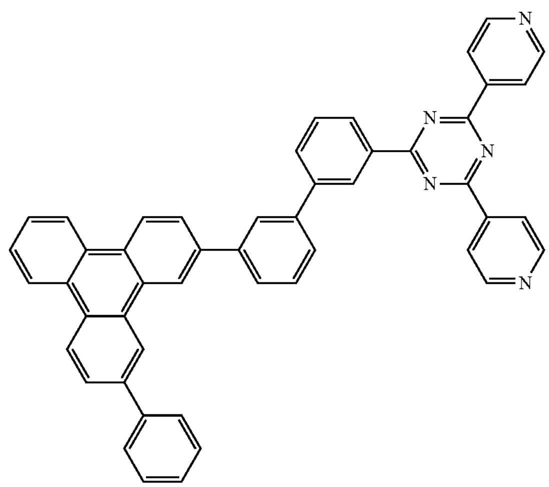

-continued
A-117
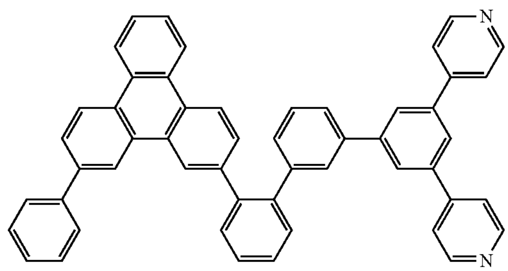
A-118
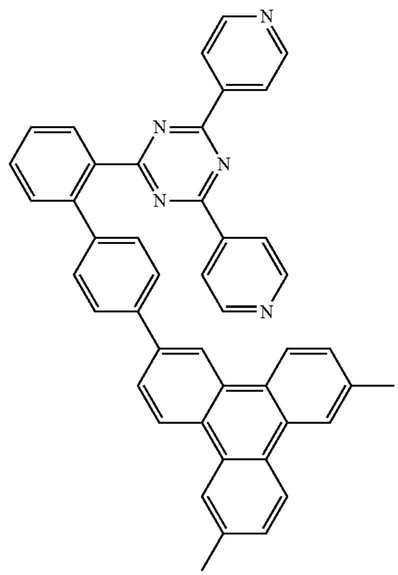
A-119
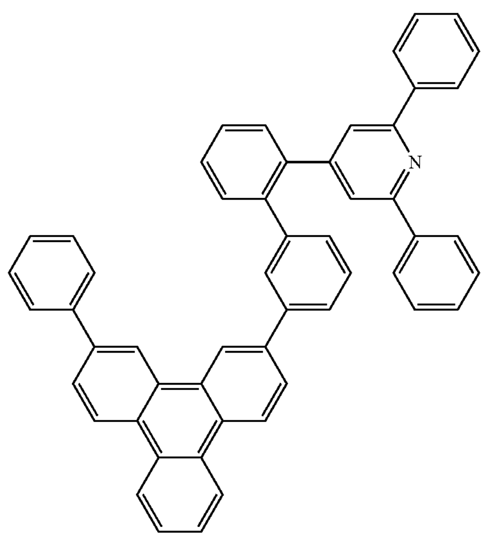
A-120
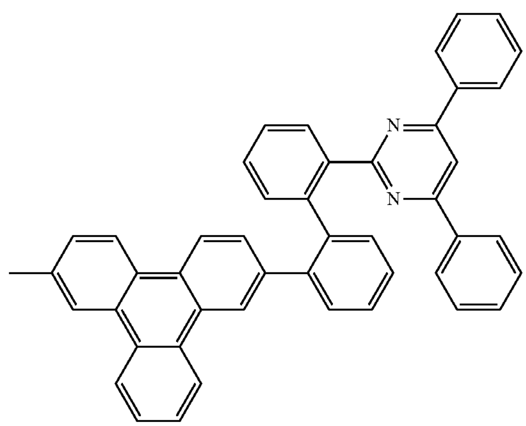
A-121
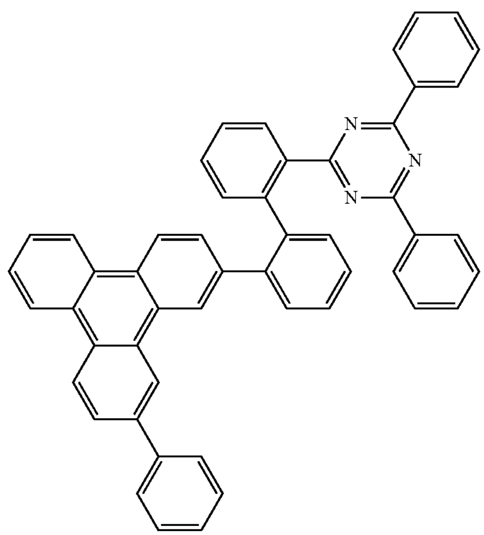
A-122
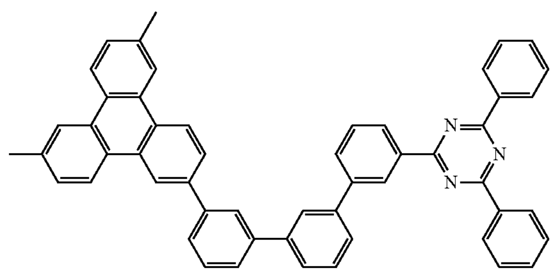

-continued
A-123
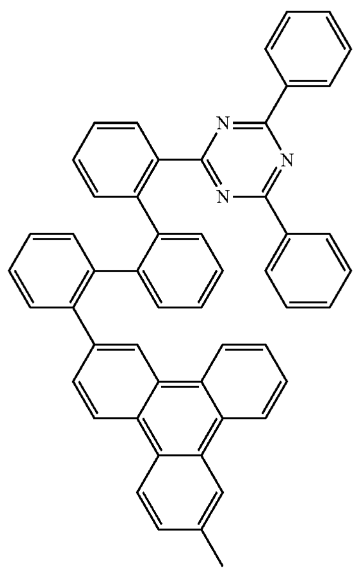
A-124
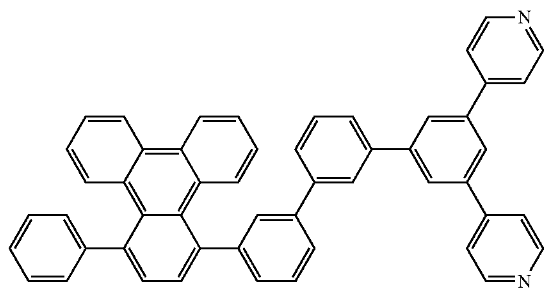
A-125
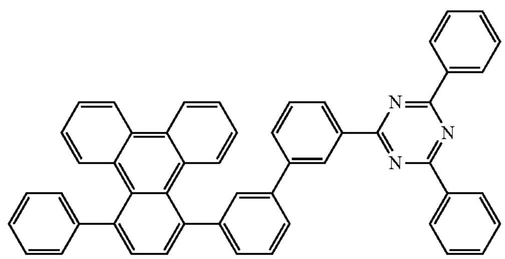
A(1)
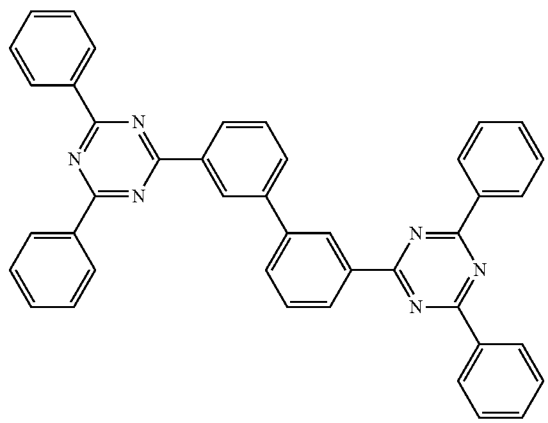
A(2)
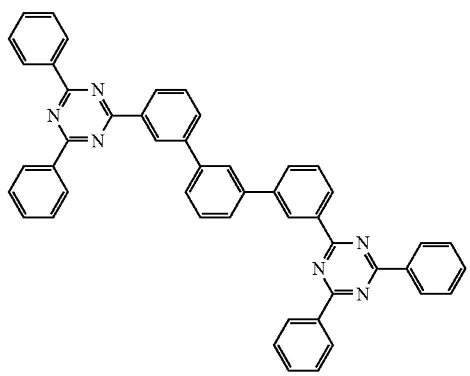
A(3)
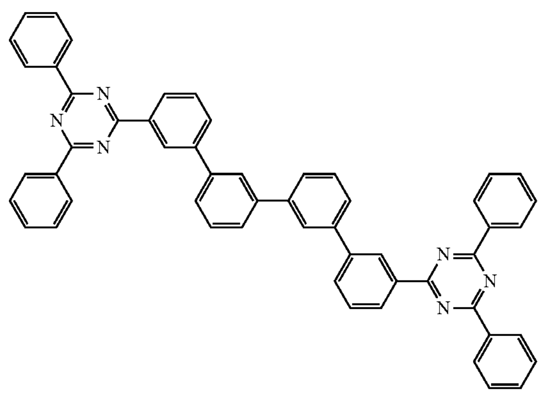

-continued
A(4)
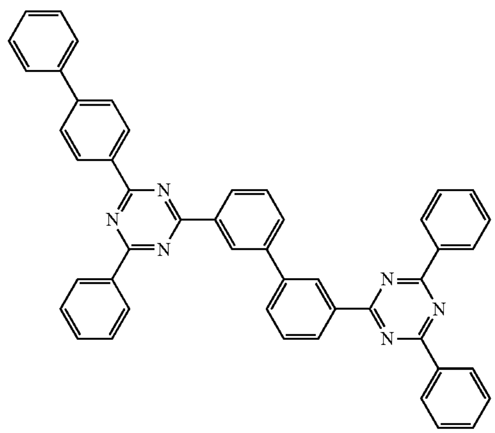
A(5)
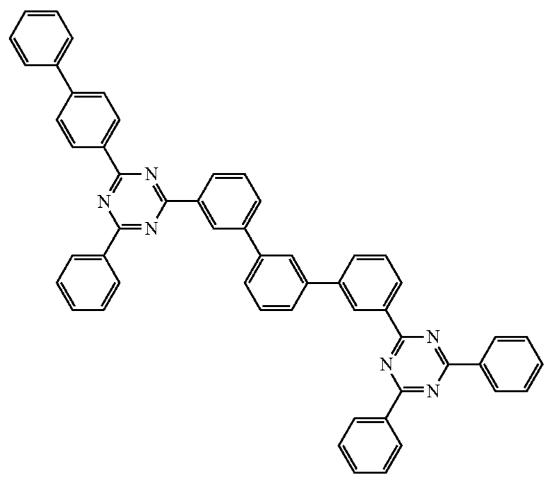
A(6)
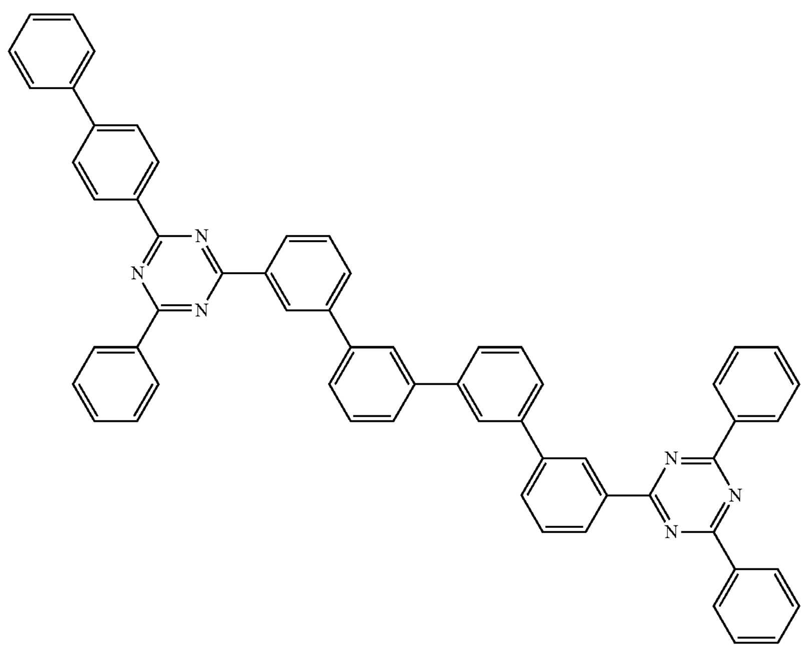
A(7)
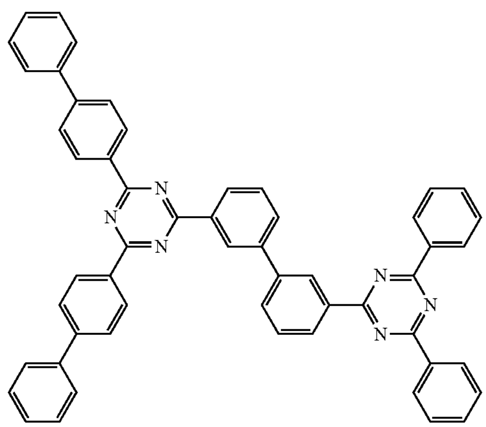
A(8)
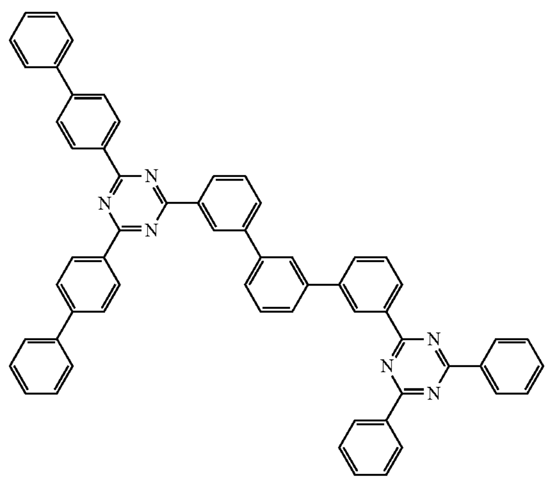

-continued
A(9)
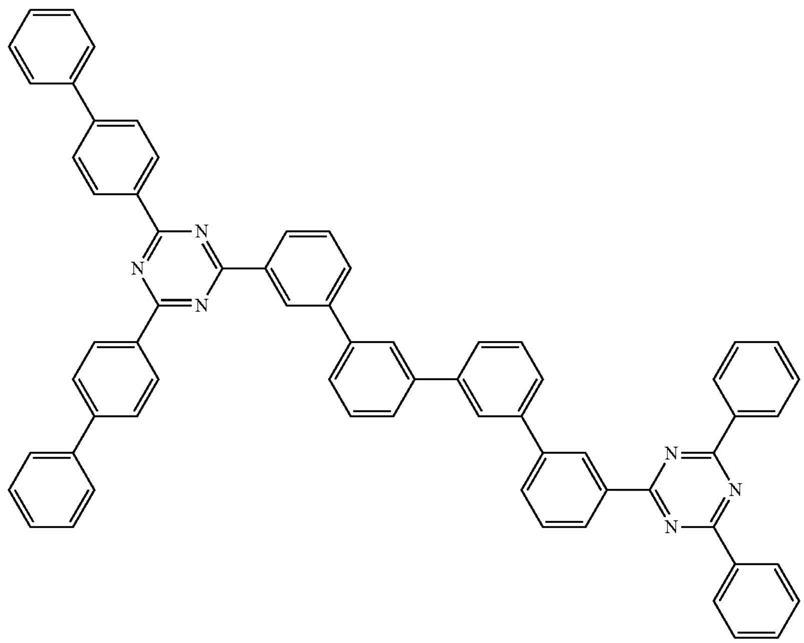
A(10)
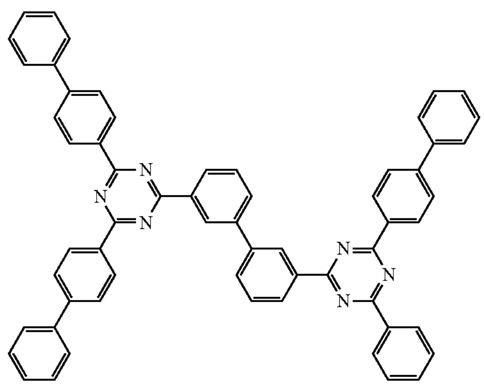
A(11)
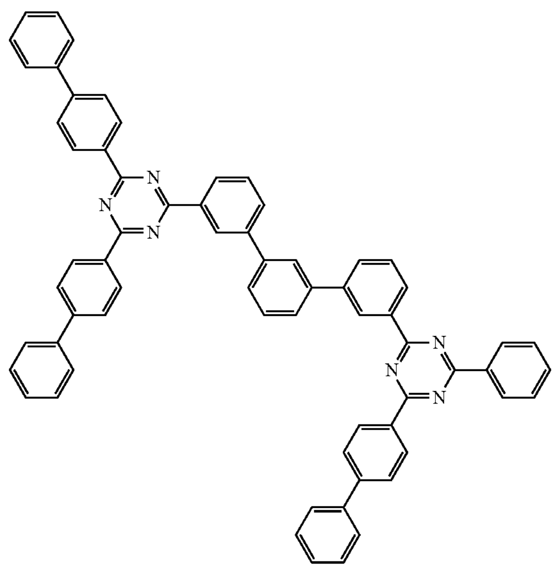

-continued
A(12)
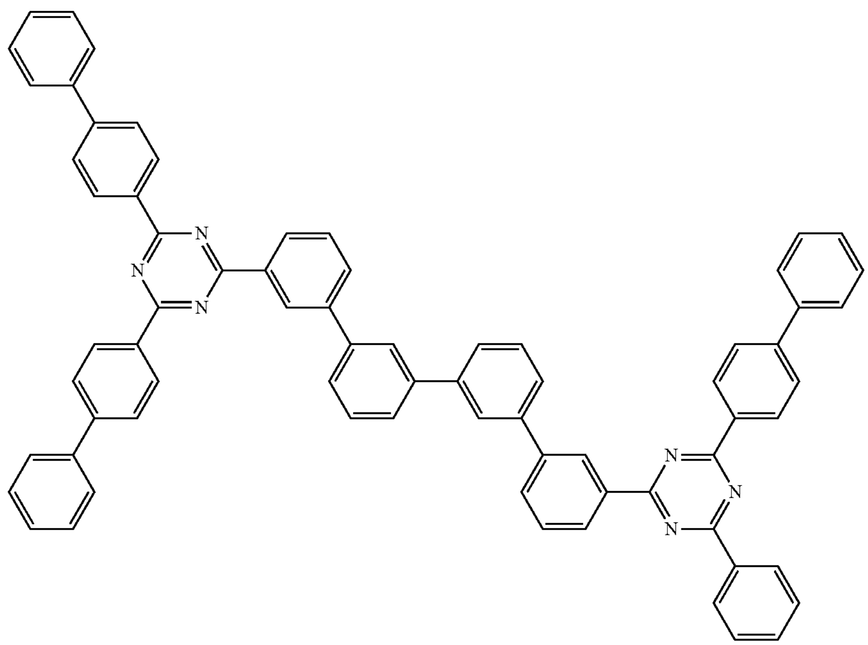
A(13)
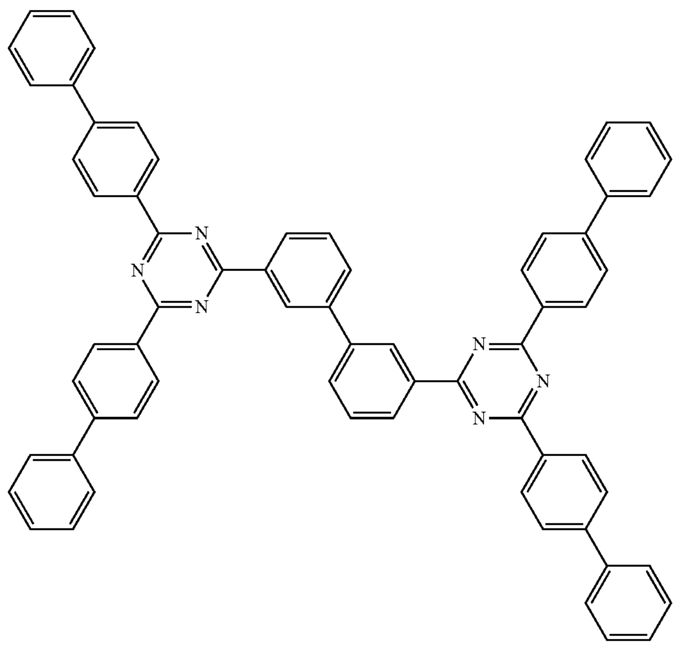

-continued
A(14)
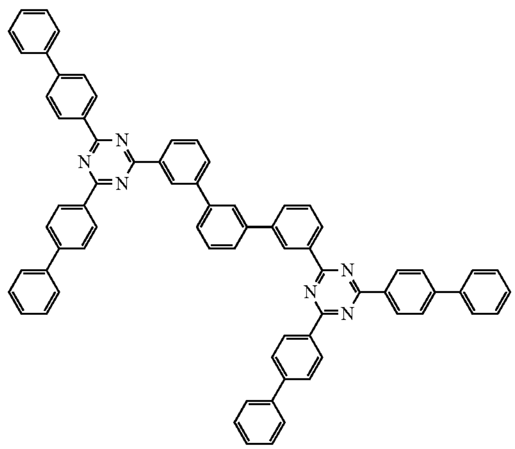
A(15)
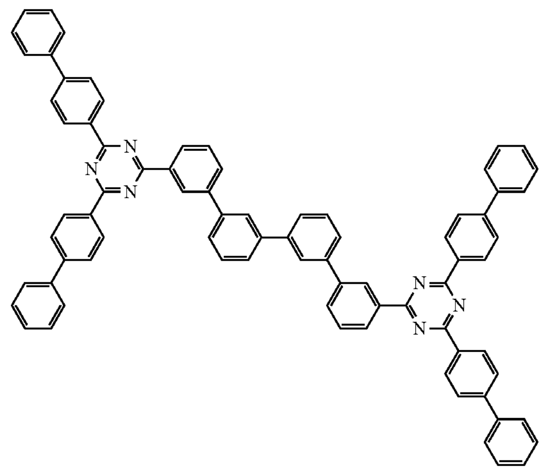
A(16)
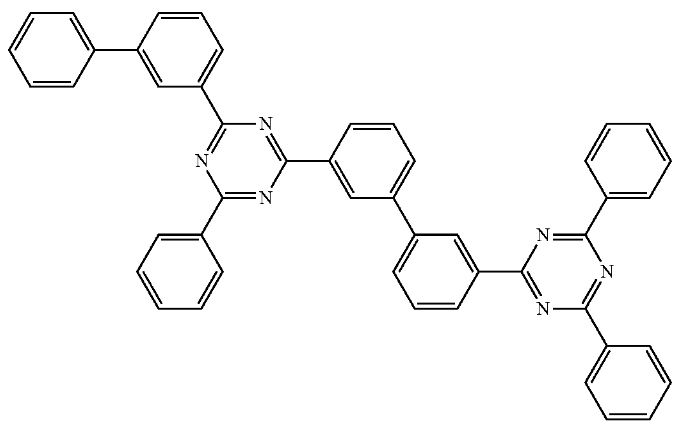
A(17)
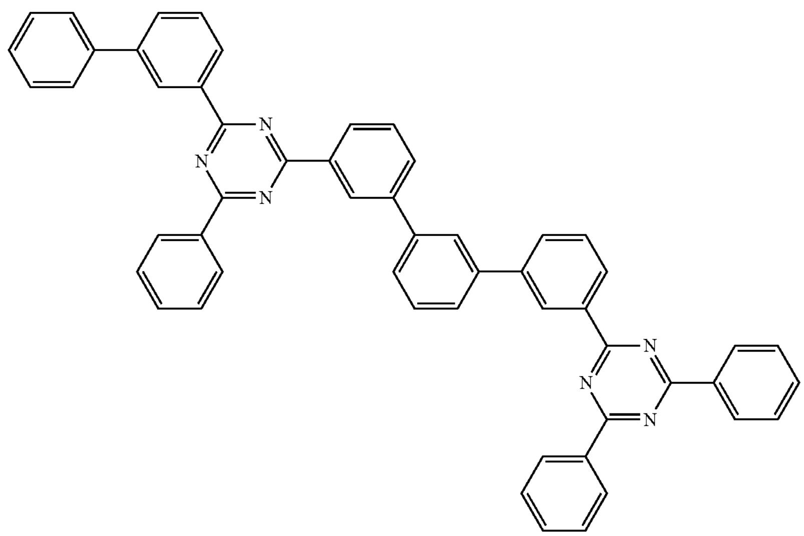

-continued
A(18)
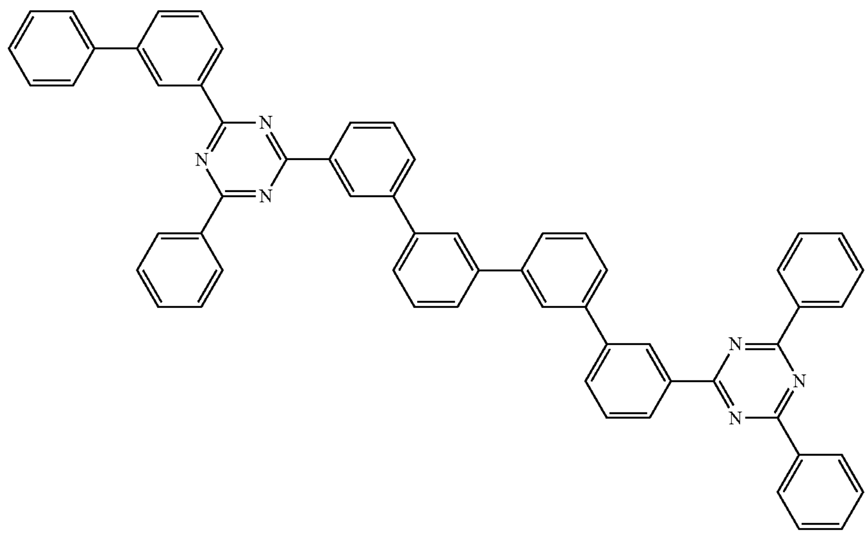
A(19)
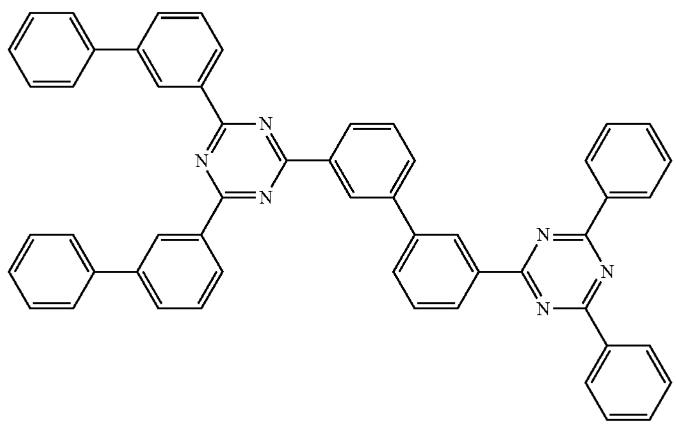
A(20)
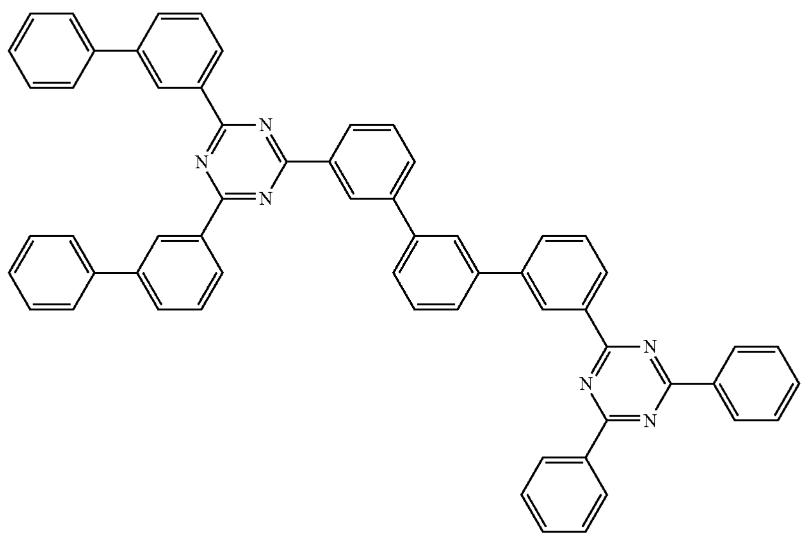

-continued
A(21)
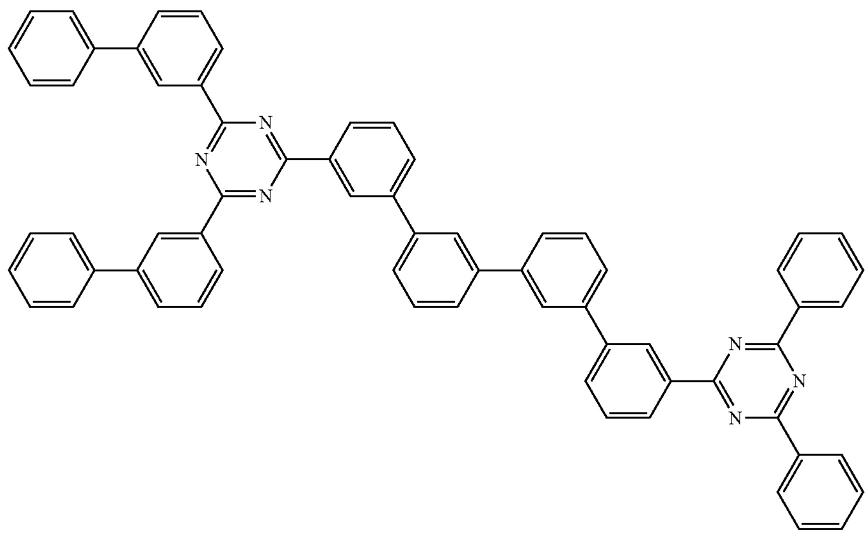
A(22)
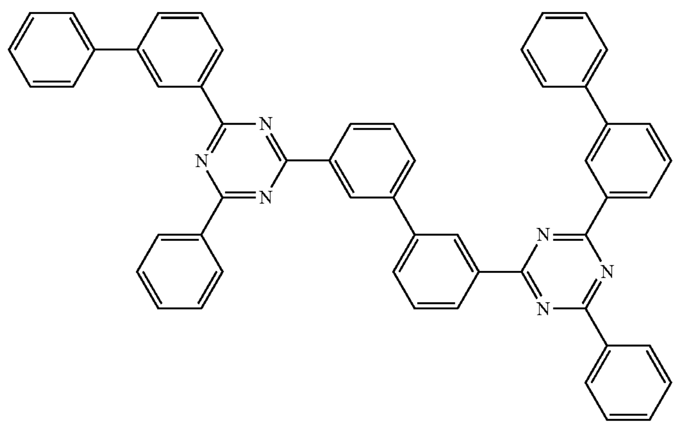
A(23)
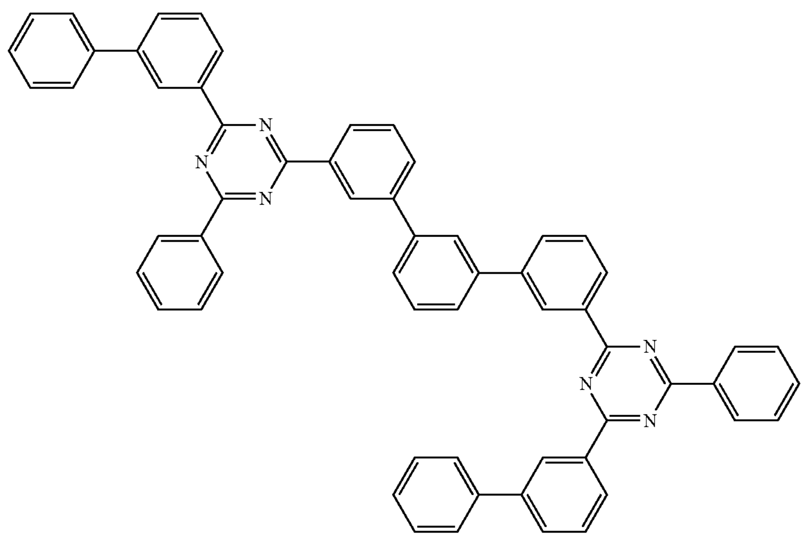

-continued
A(24)
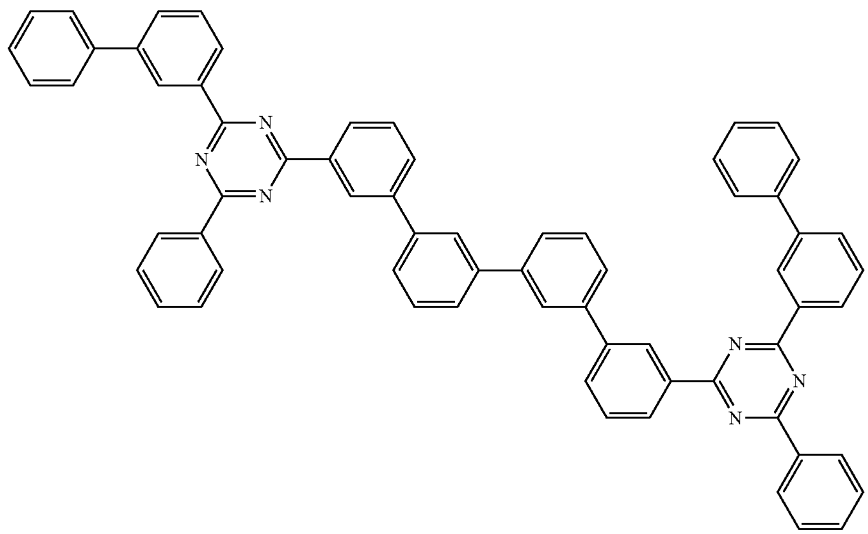
A(25)
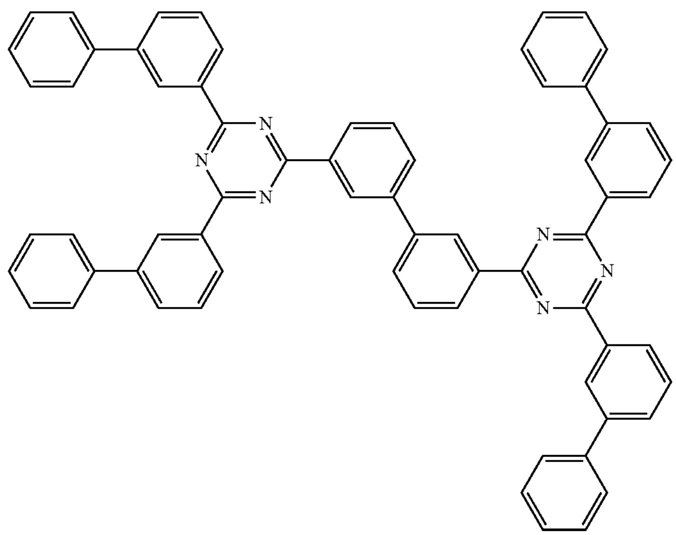
A(26)
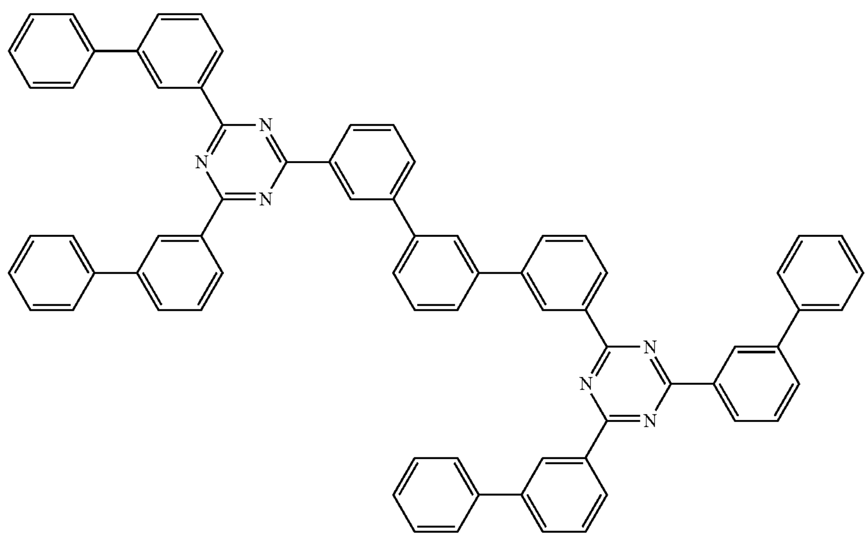

-continued
A(27)
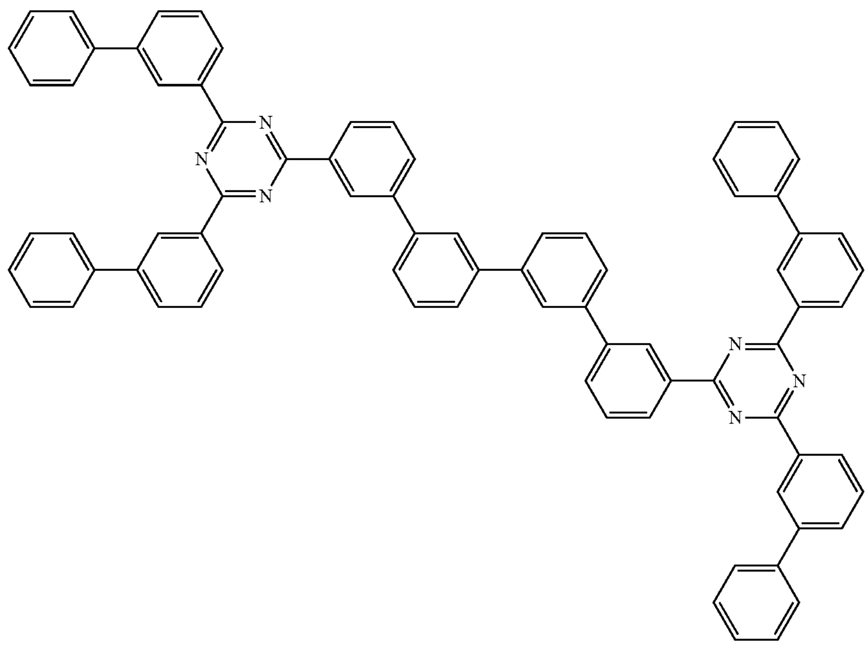
A(28)
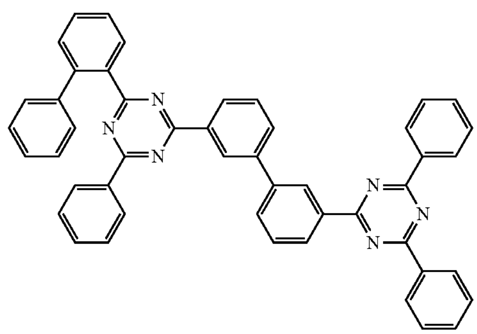
A(29)
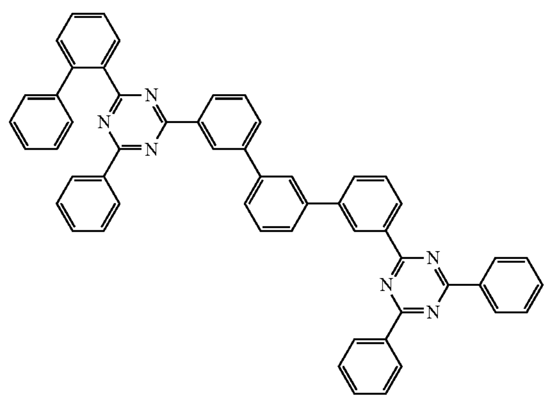
A(30)
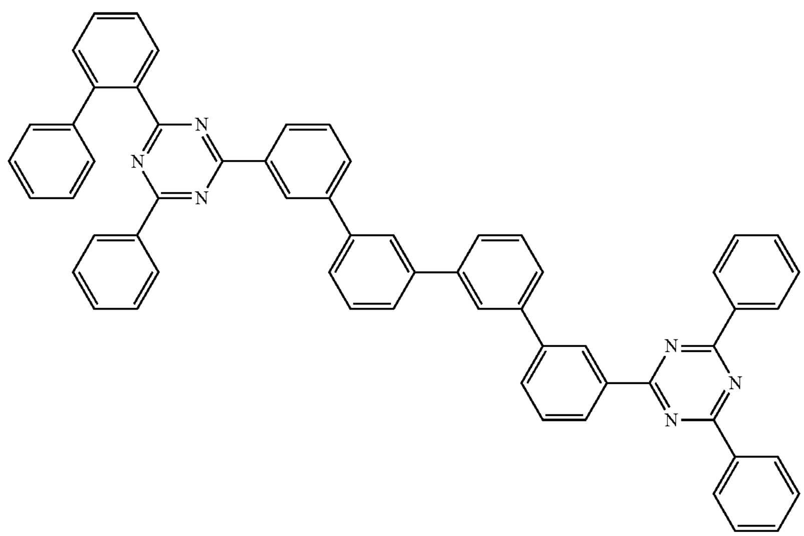

-continued
A(31)
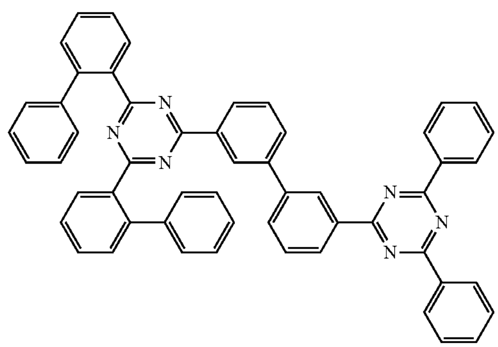
A(32)
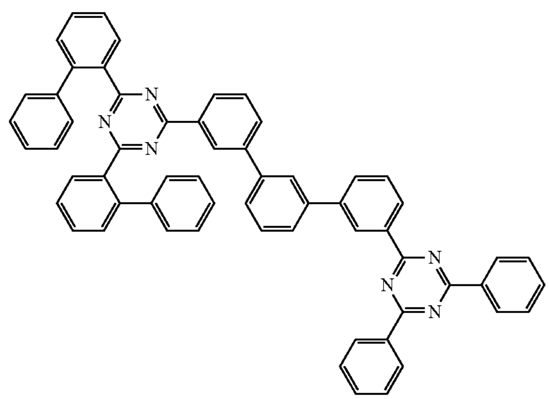
A(33)
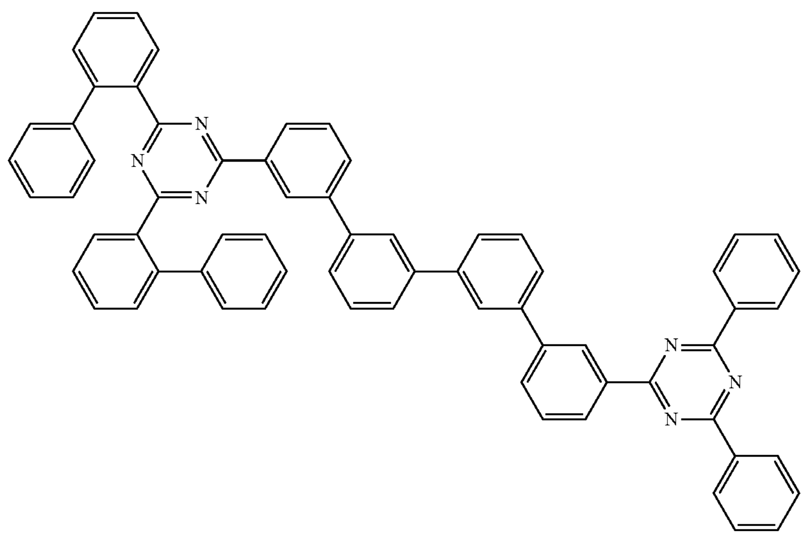
A(34)
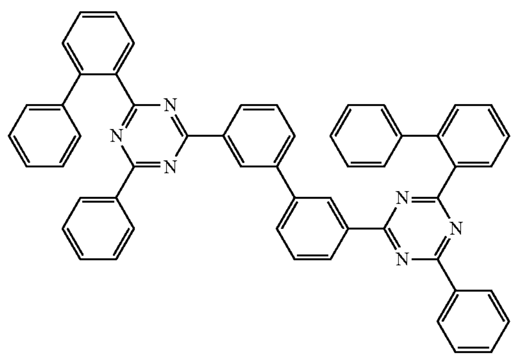
A(35)
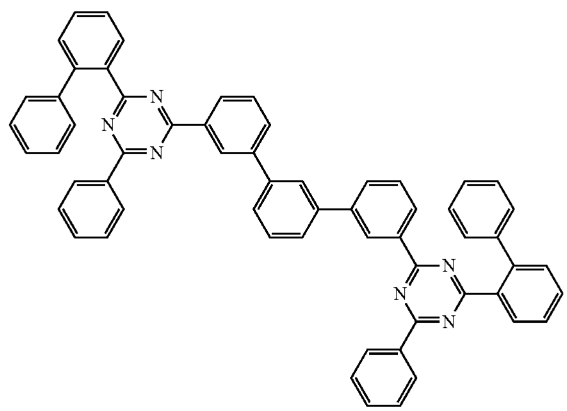

-continued
A(36)
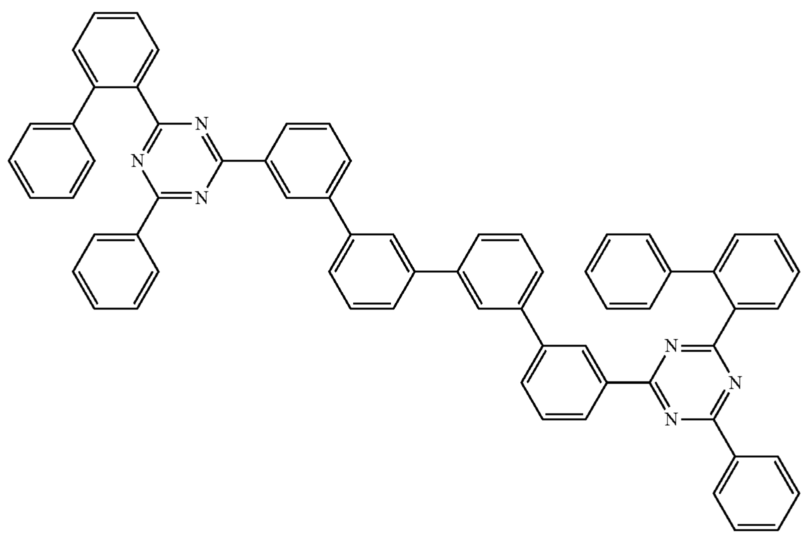
A(37)
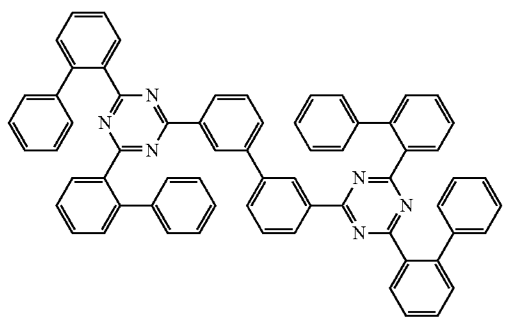
A(38)
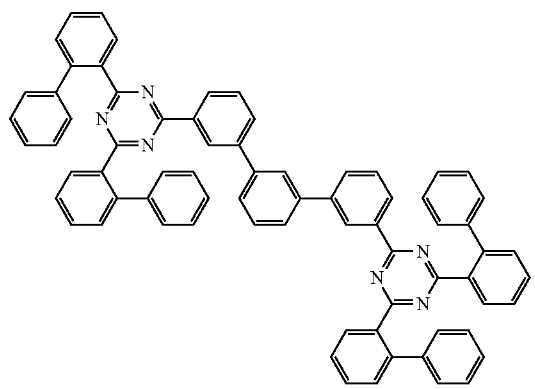
A(39)
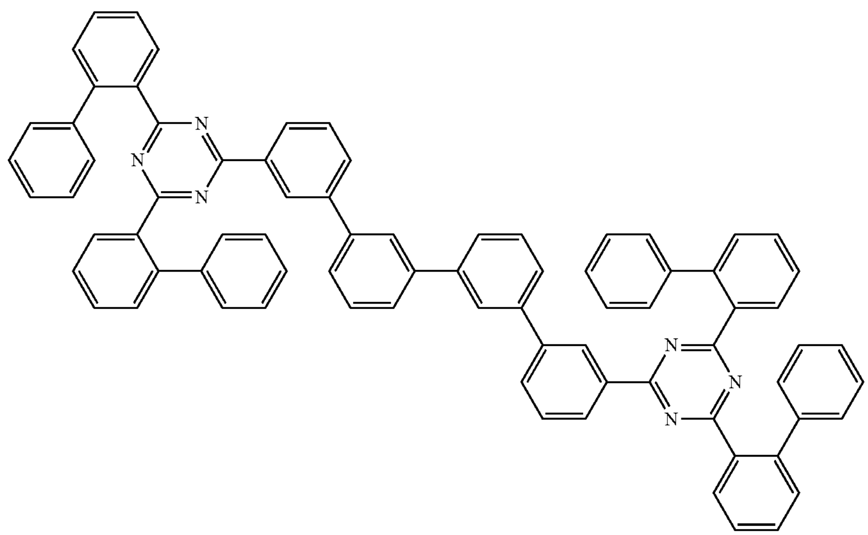

-continued
A(40)
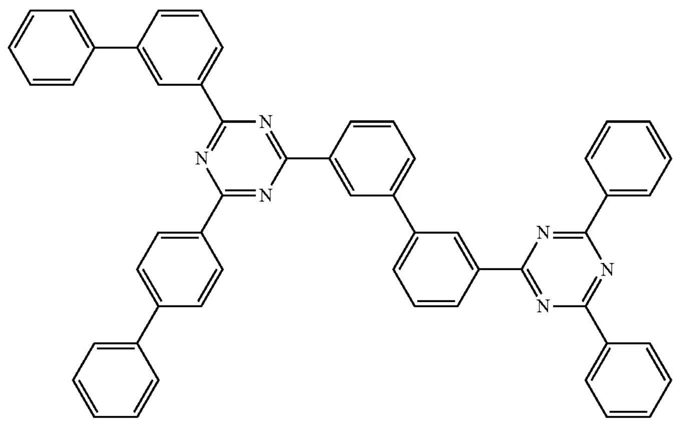
A(41)
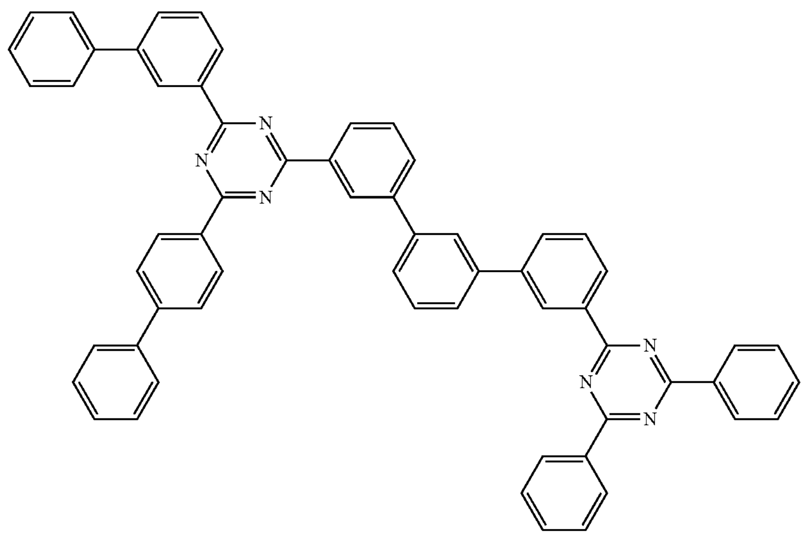
A(42)
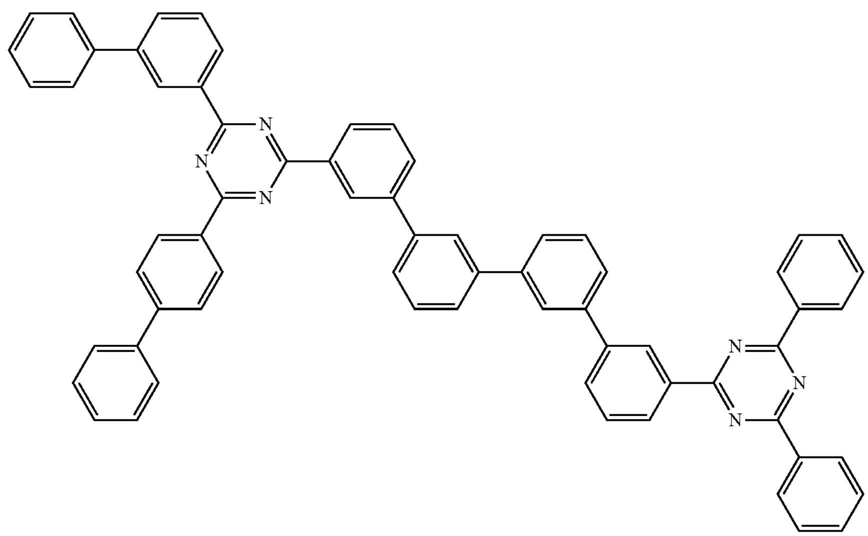

-continued
A(43)
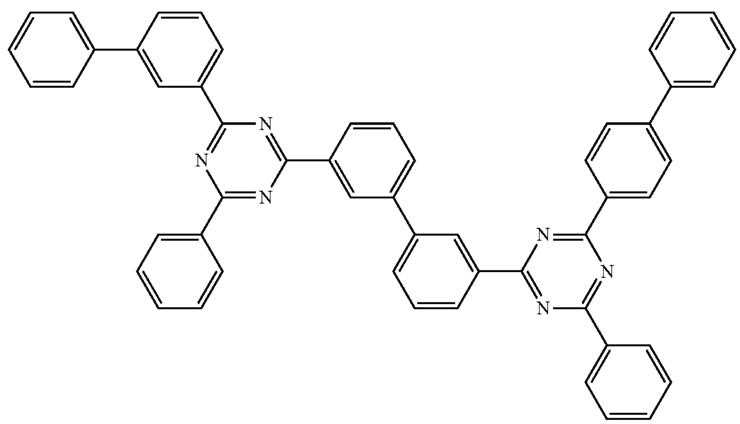
A(44)
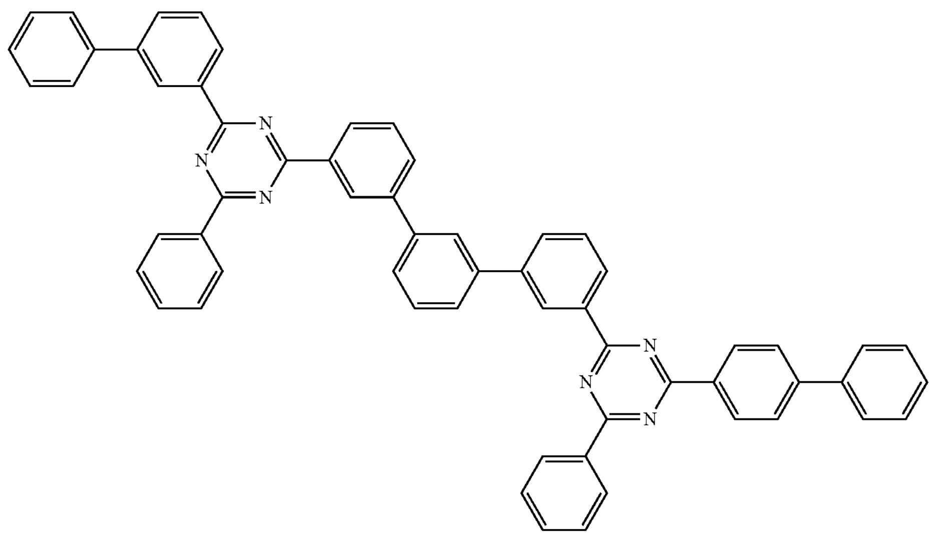
A(45)
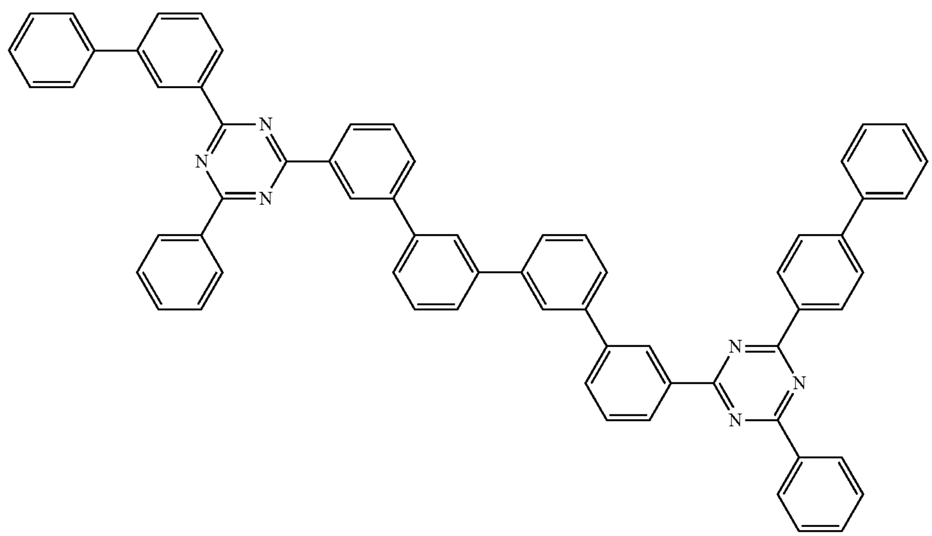

-continued
A(46)
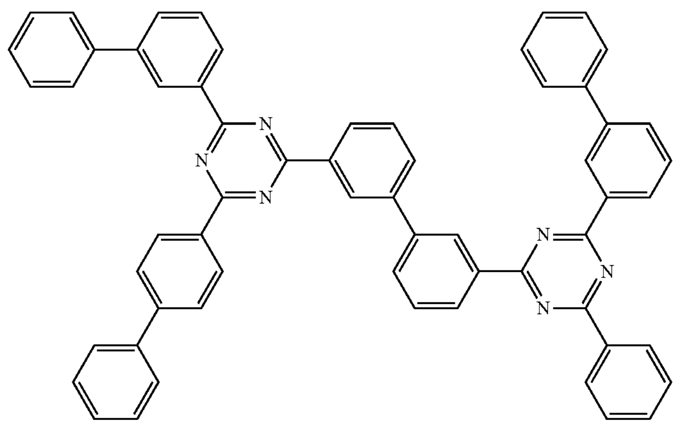
A(47)
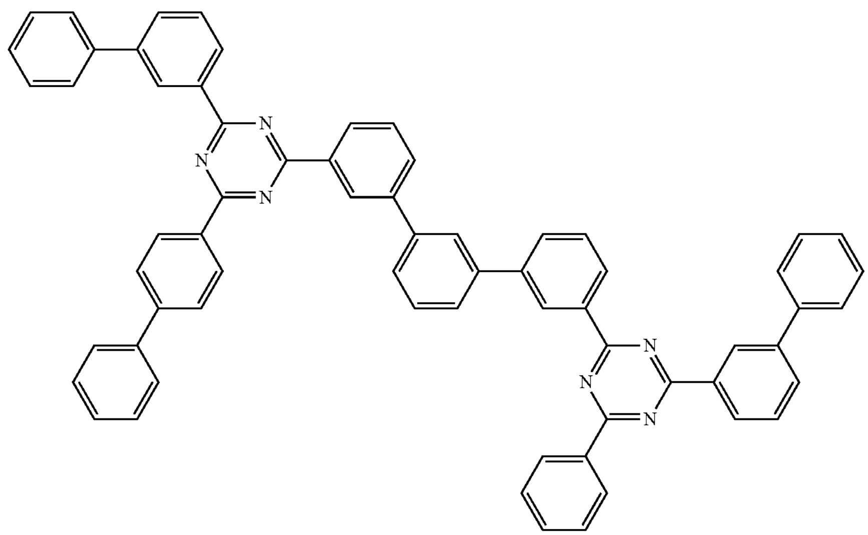
A(48)
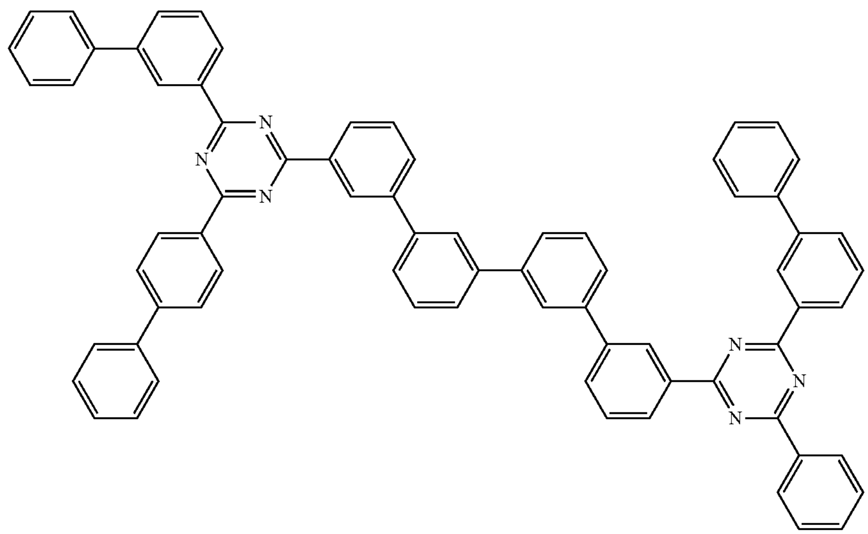

-continued
A(49)
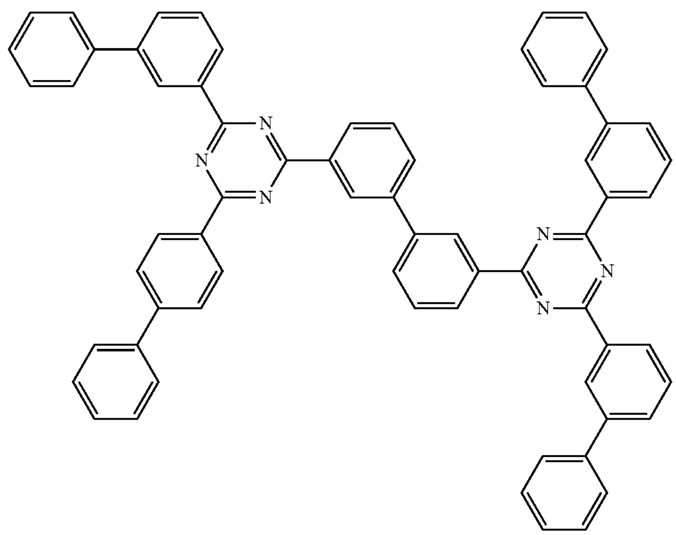
A(50)
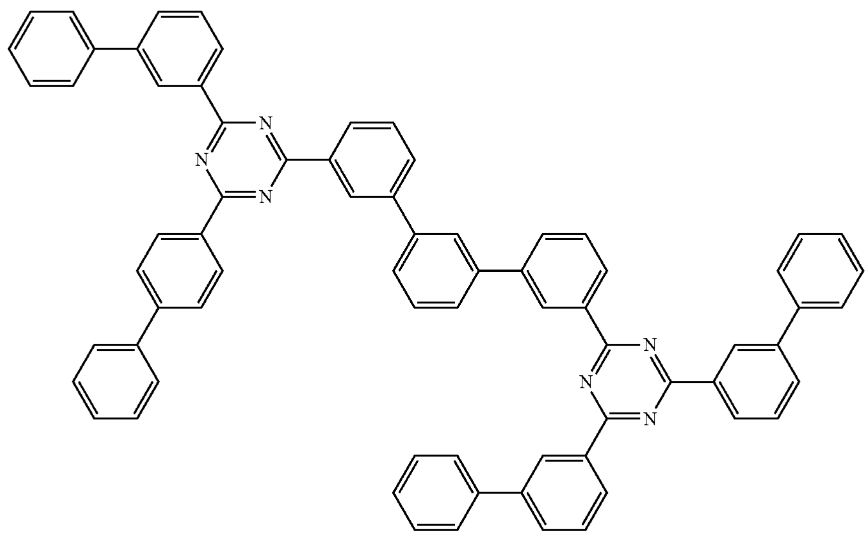
A(51)
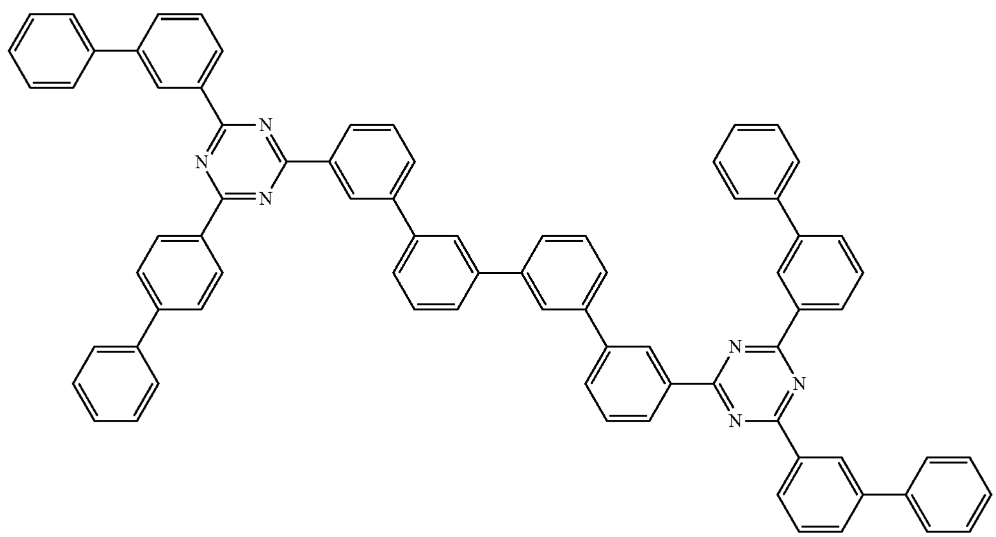

A(52)
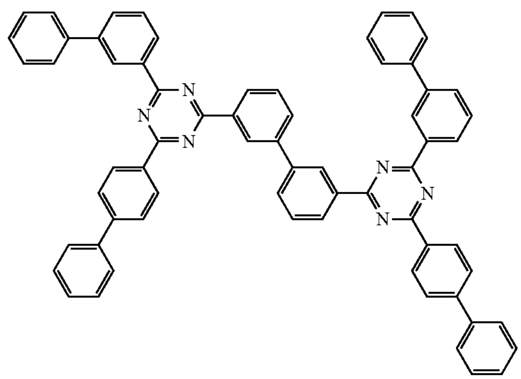
A(53)
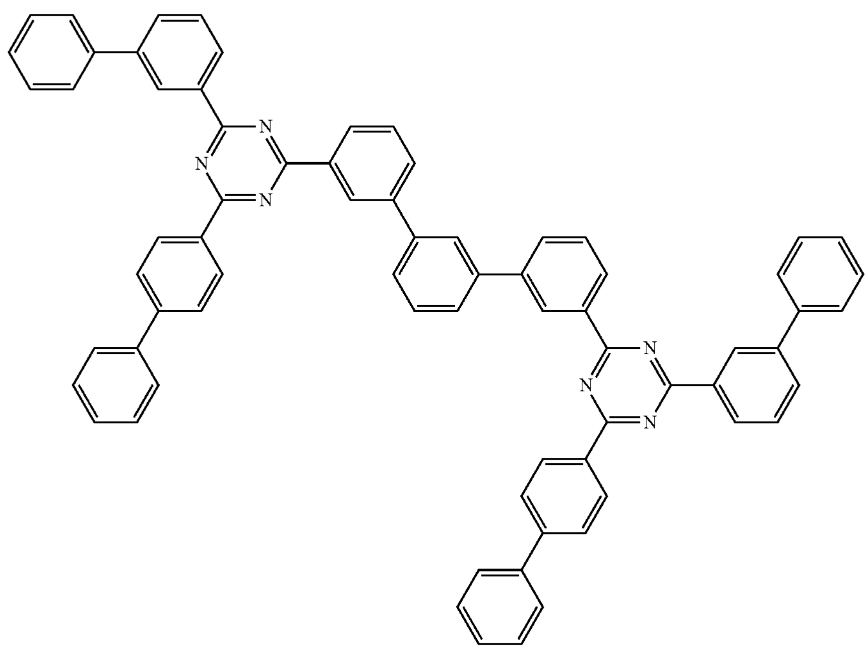
A(54)
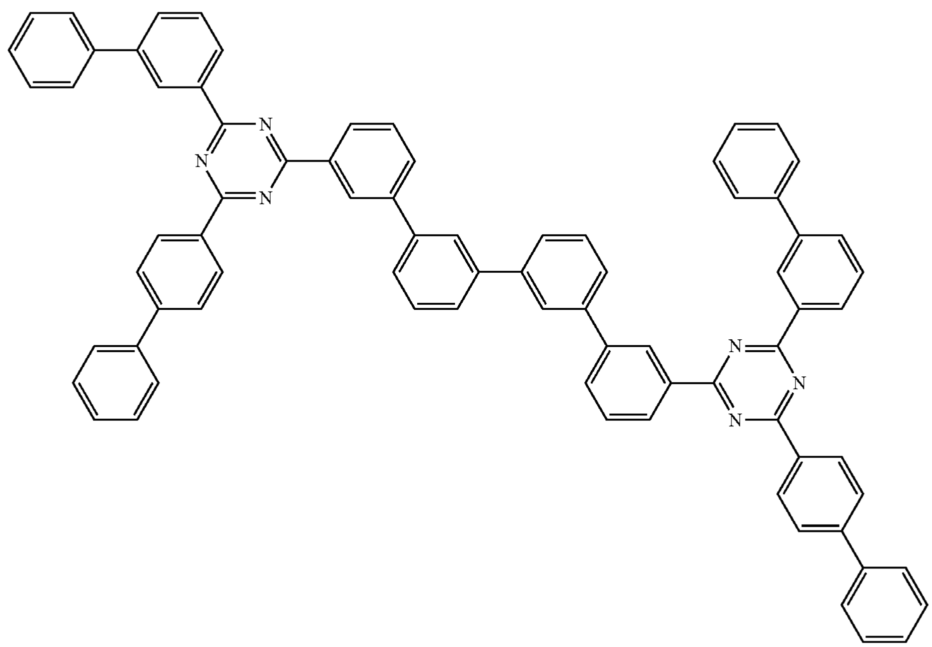

-continued
A(55)
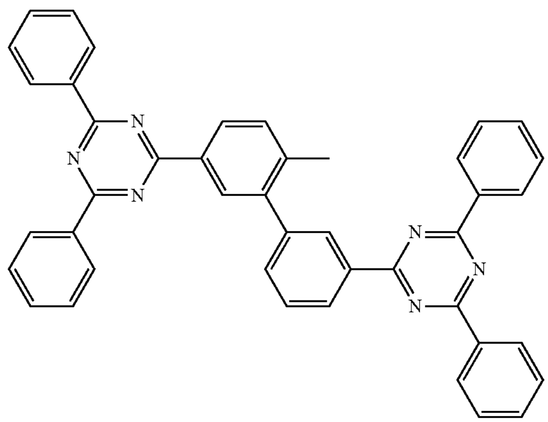
A(56)
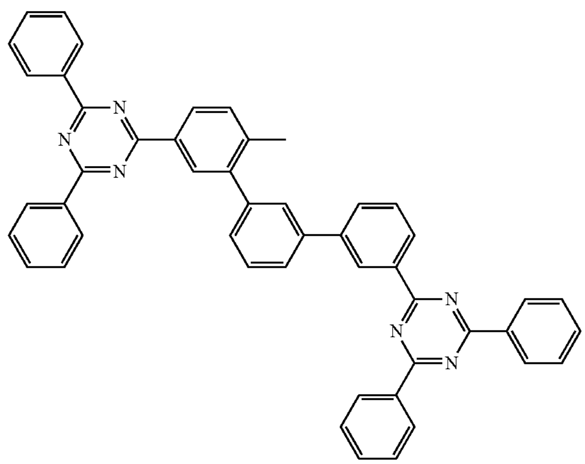
A(57)
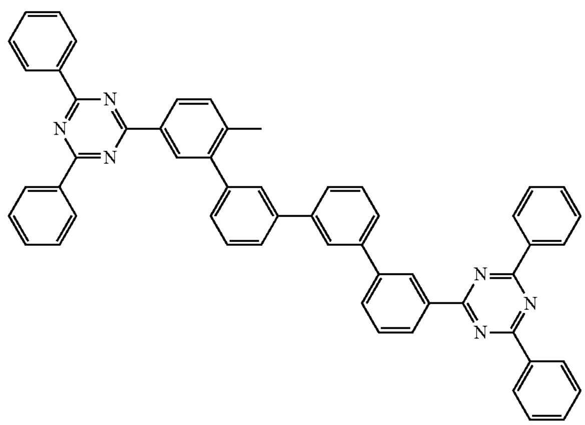

-continued
A(58)
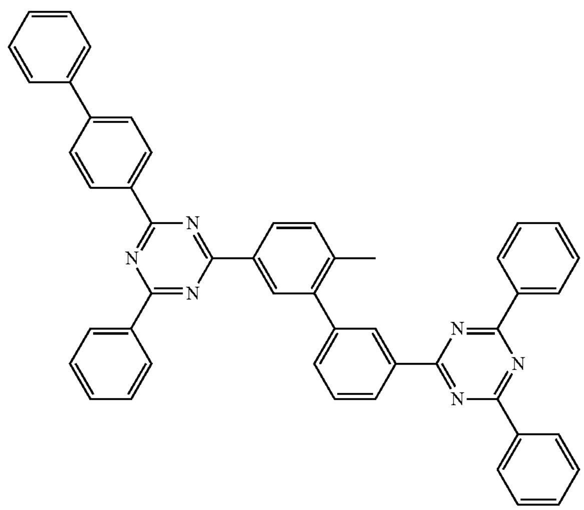
A(59)
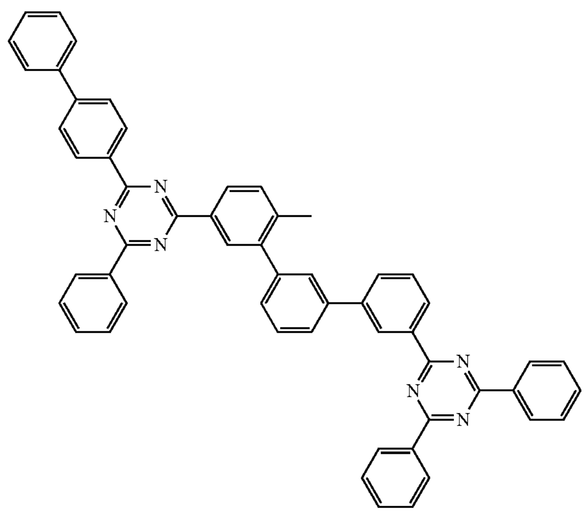
A(60)
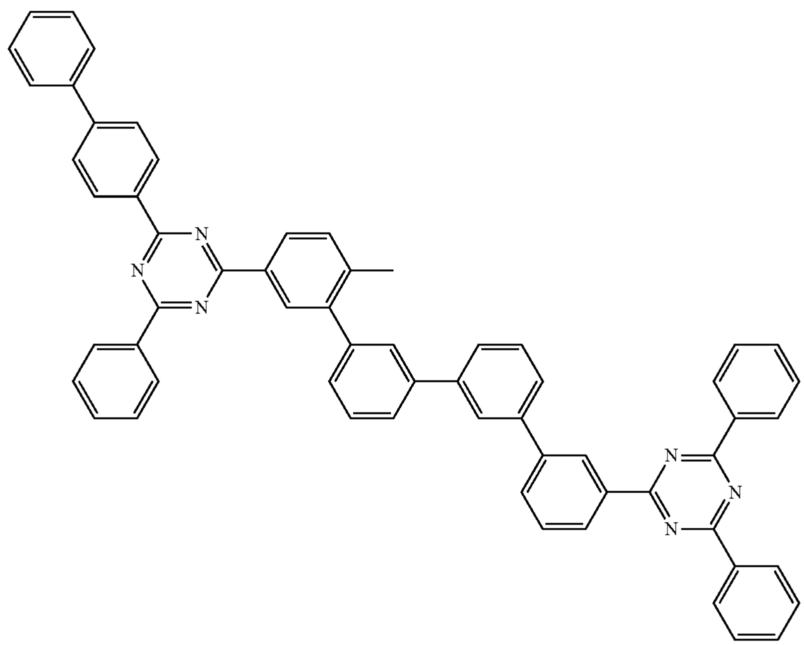

-continued
A(61)
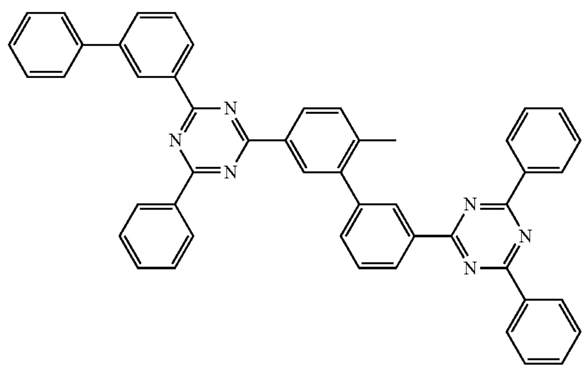
A(62)
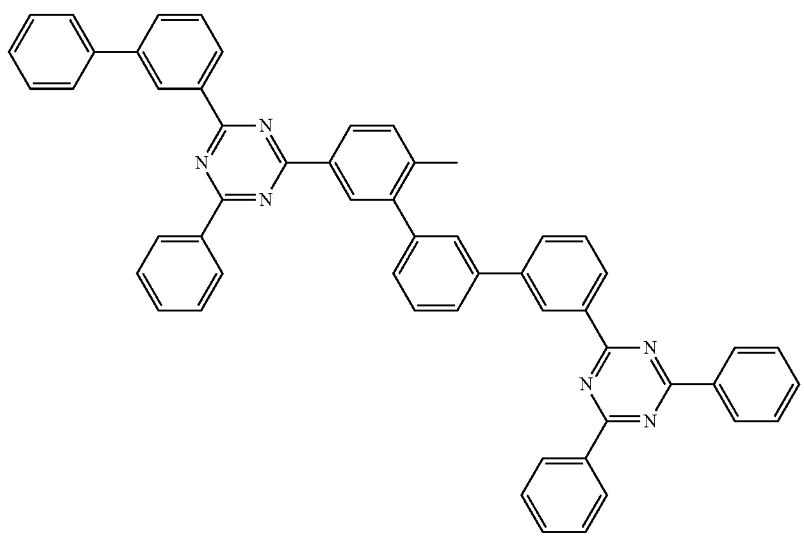
A(63)
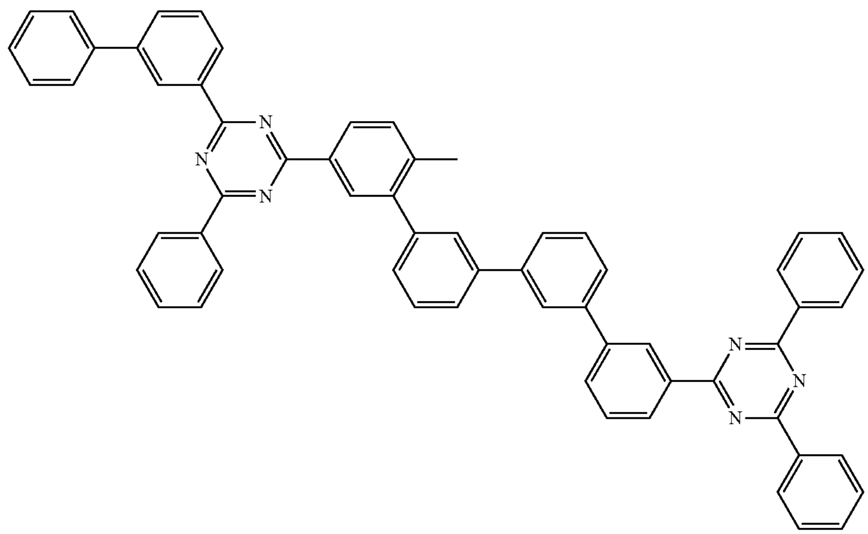

-continued
A(64)
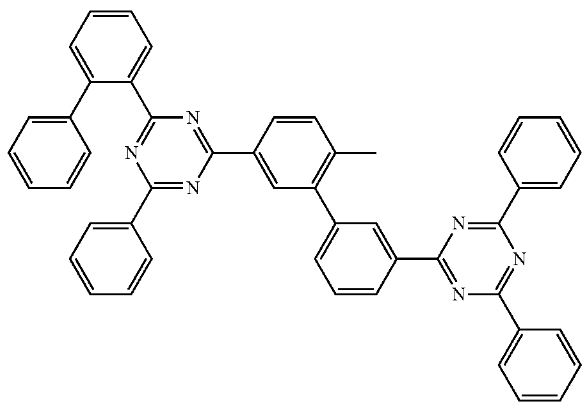
A(65)
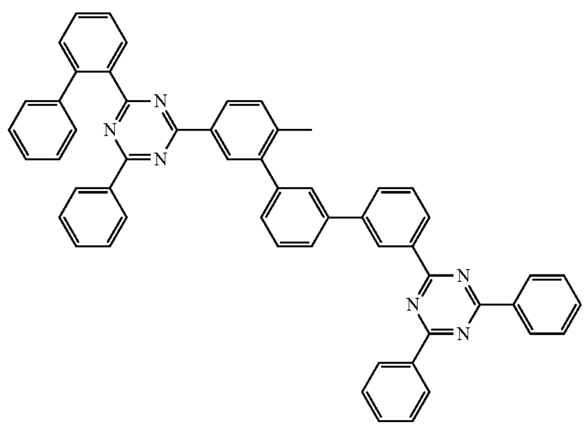
A(66)
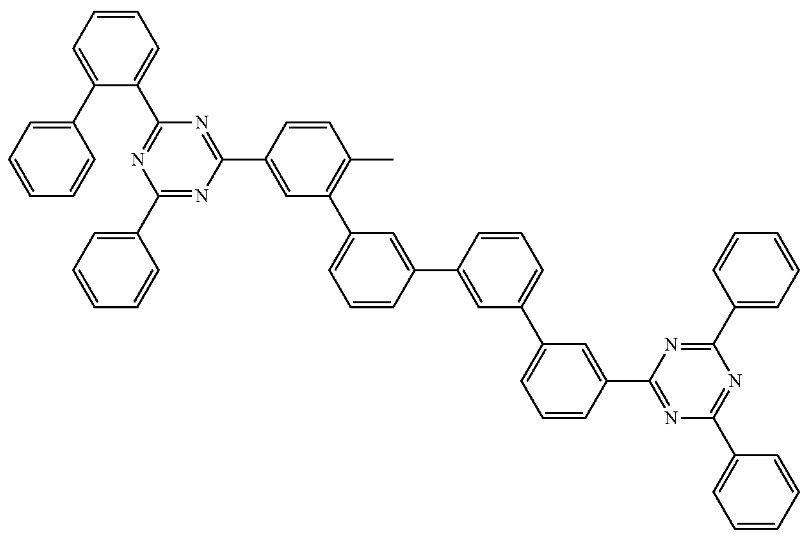

-continued
A(67)
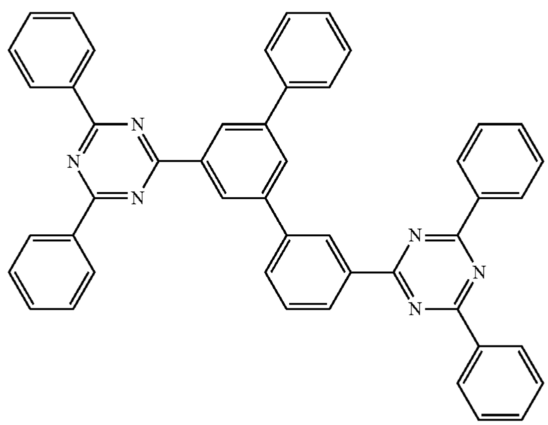
A(68)
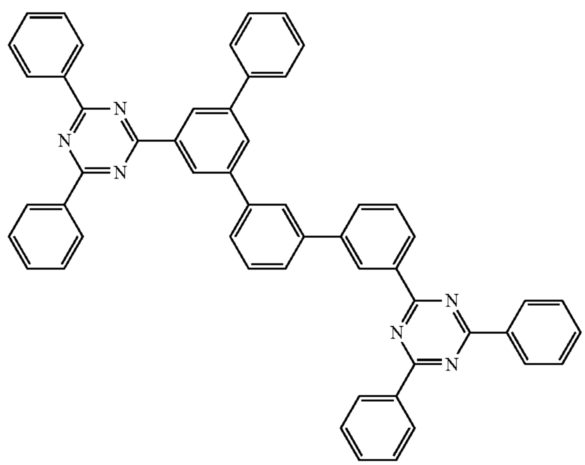
A(69)
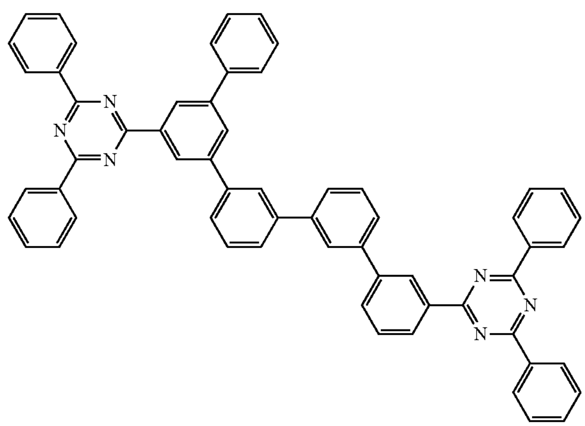

-continued
A(70)
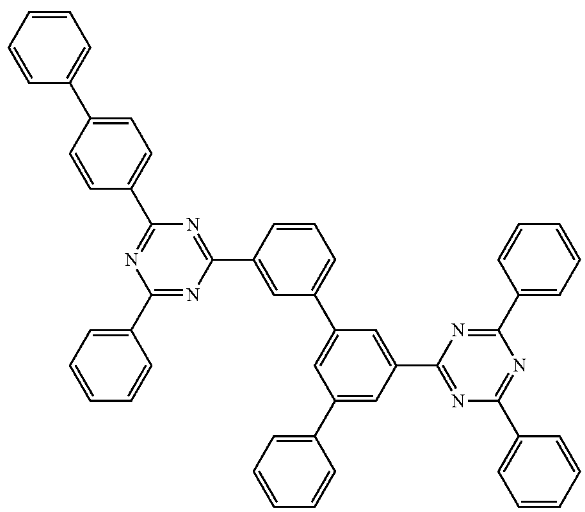
A(71)
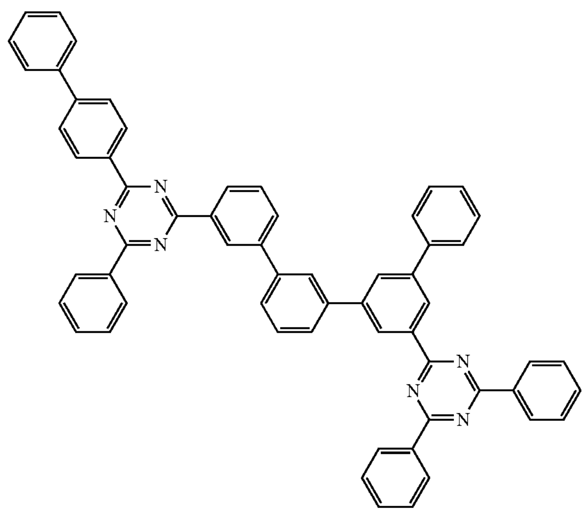
A(72)
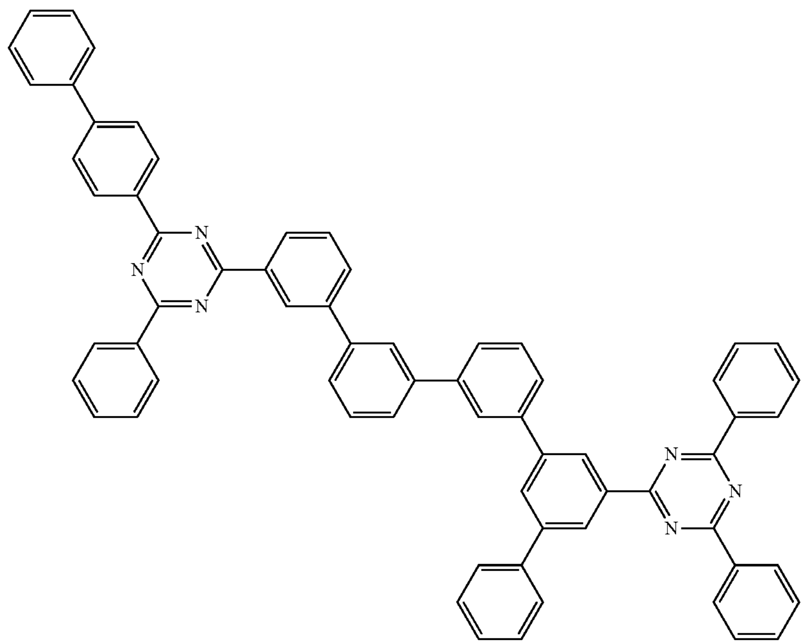

-continued
A(73)
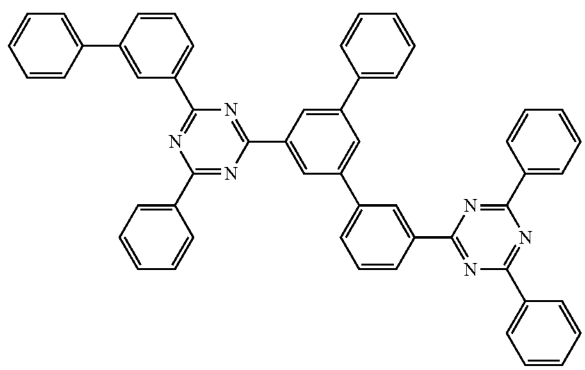
A(74)
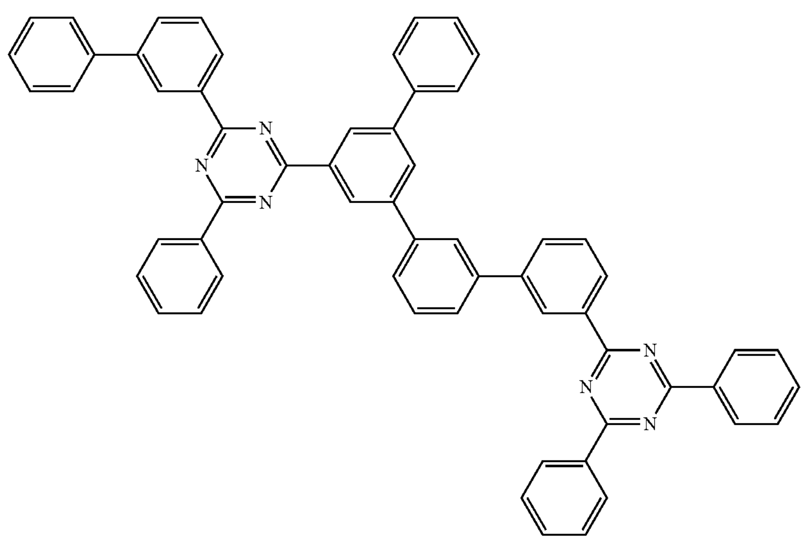
A(75)
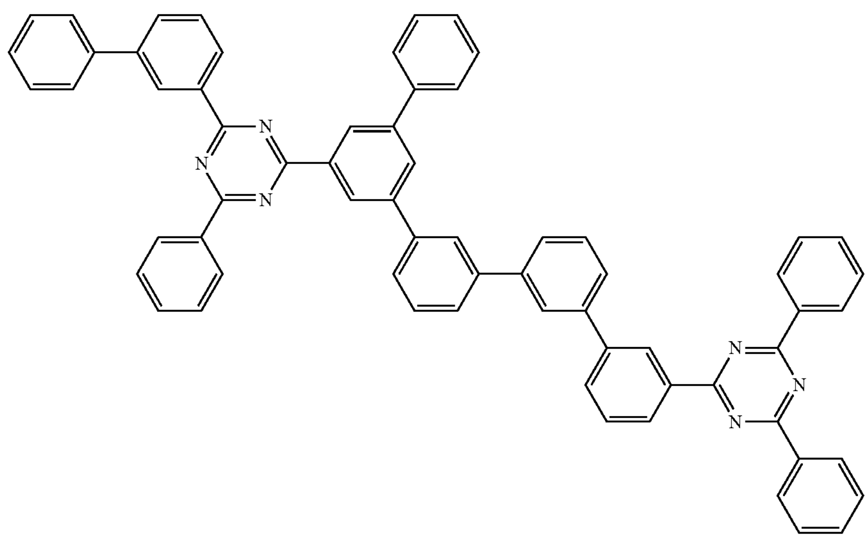

-continued
A(76)
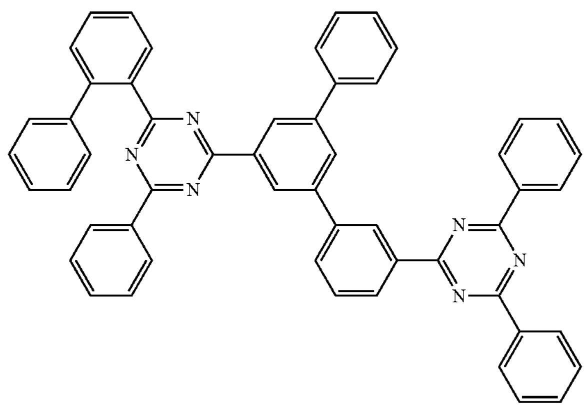
A(77)
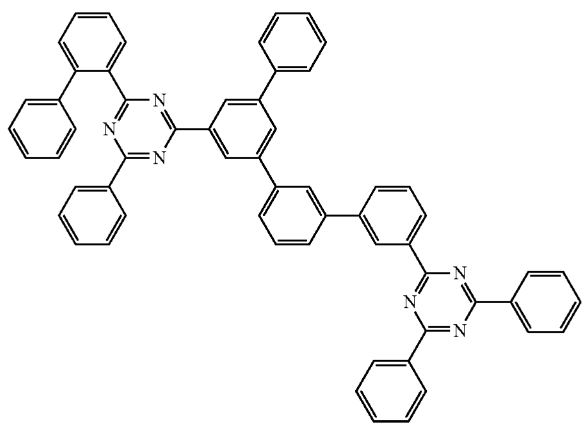
A(78)
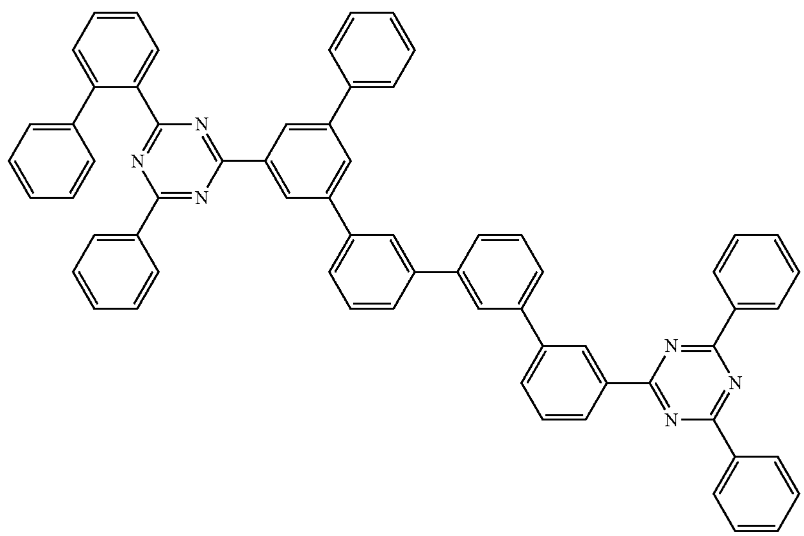

-continued
A(79)
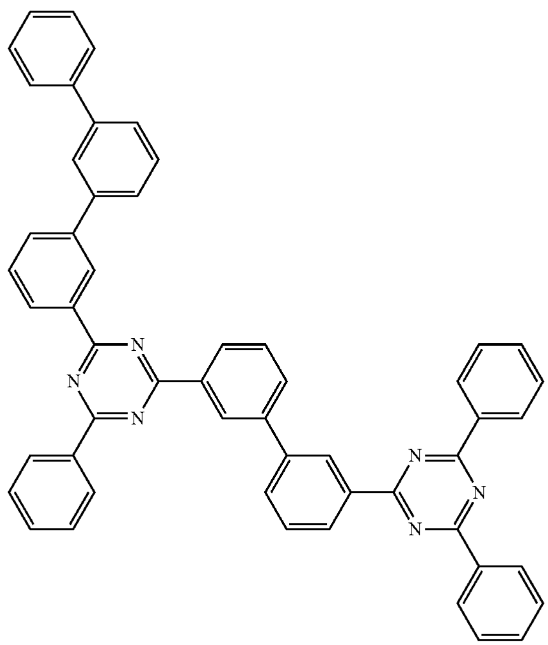
A(80)
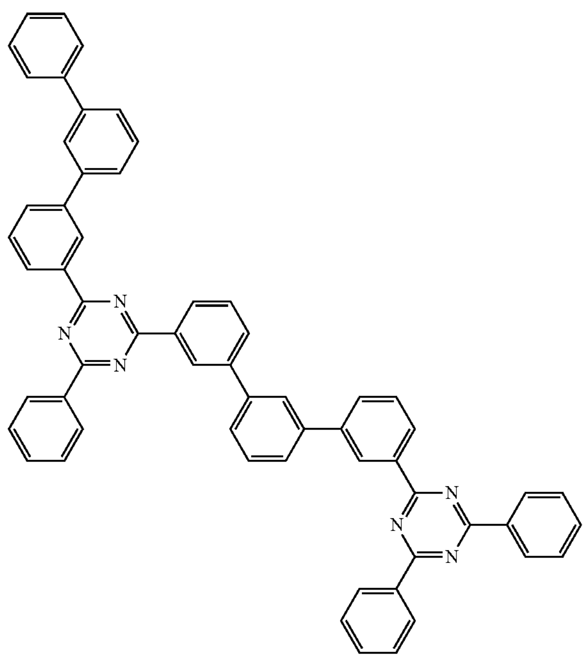

-continued
A(81)
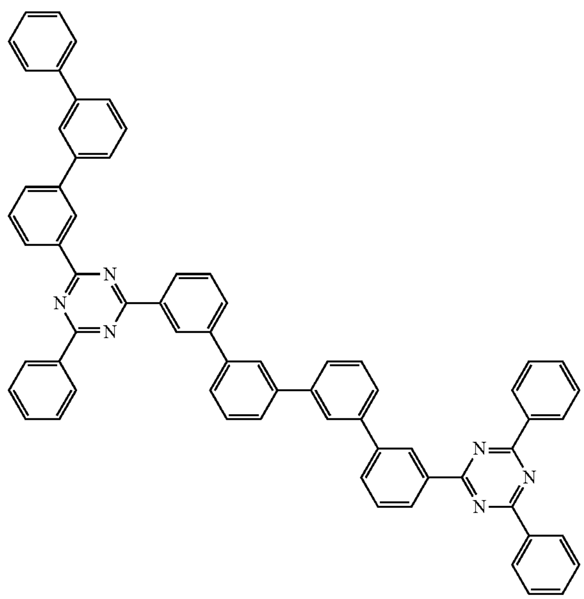
A(82)
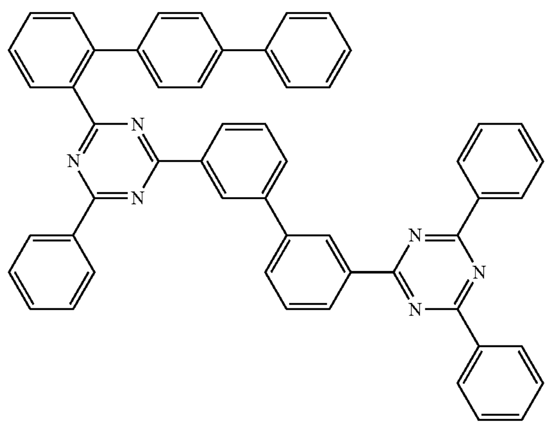
A(83)
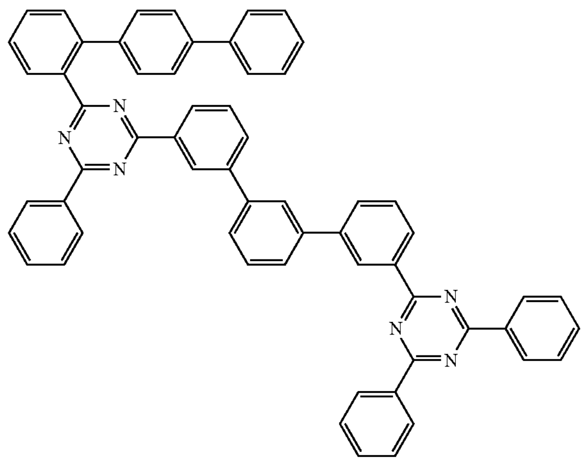

-continued
A(84)
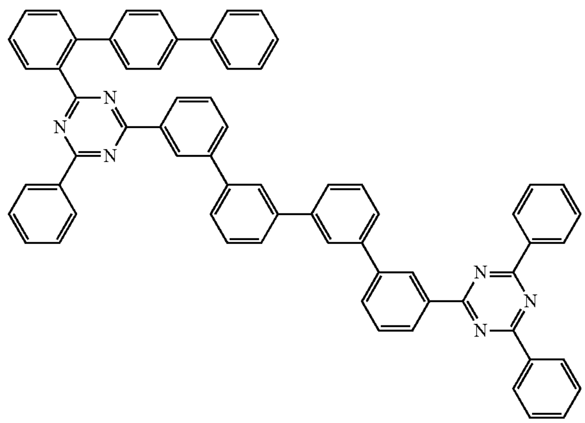
A(85)
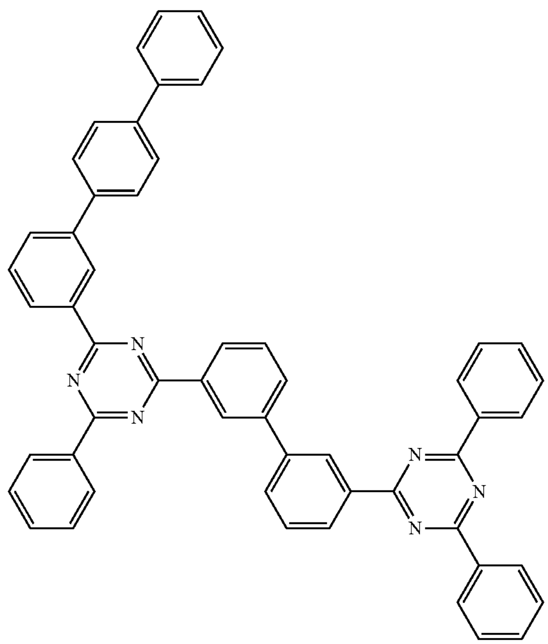

-continued
A(86)
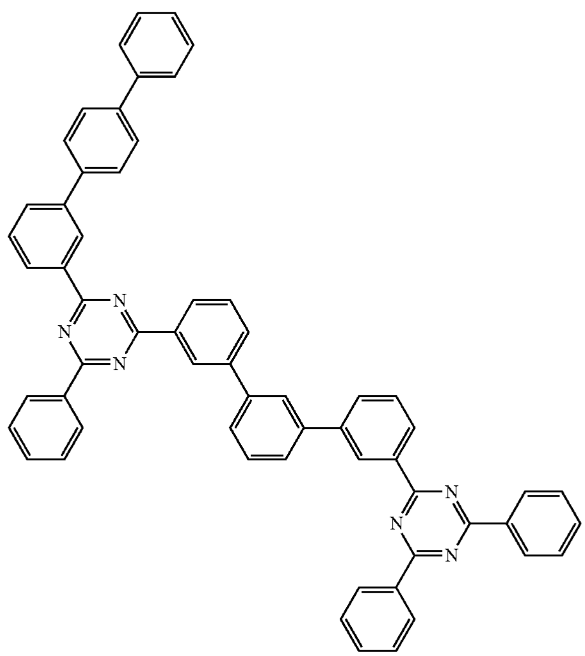
A(87)
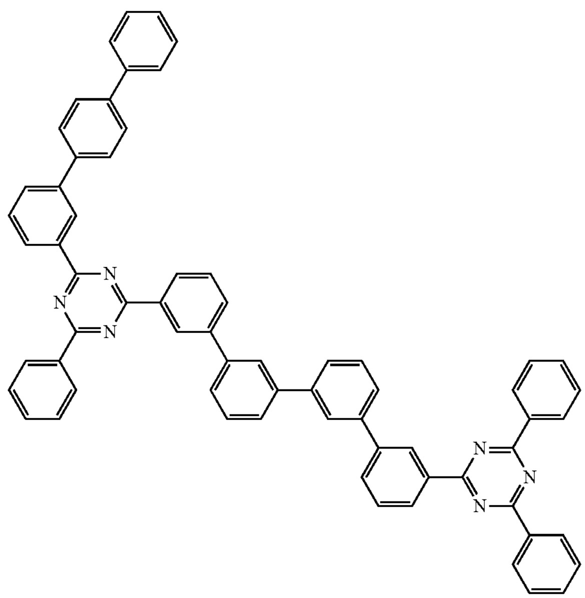

-continued
A(88)
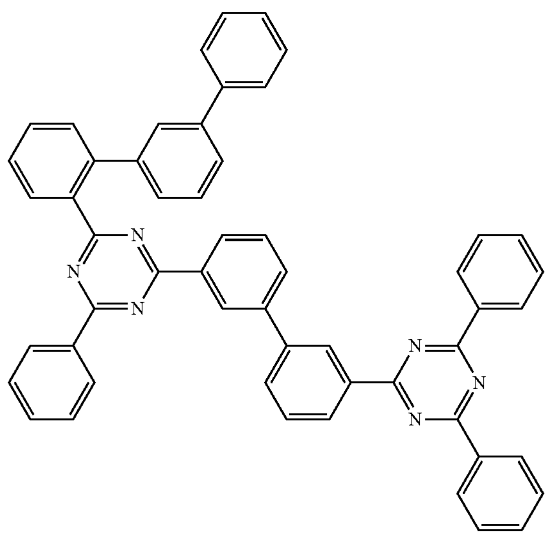
A(89)
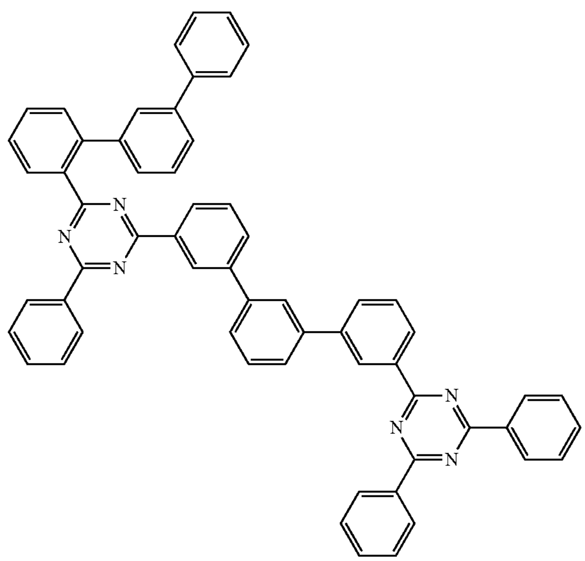
A(90)
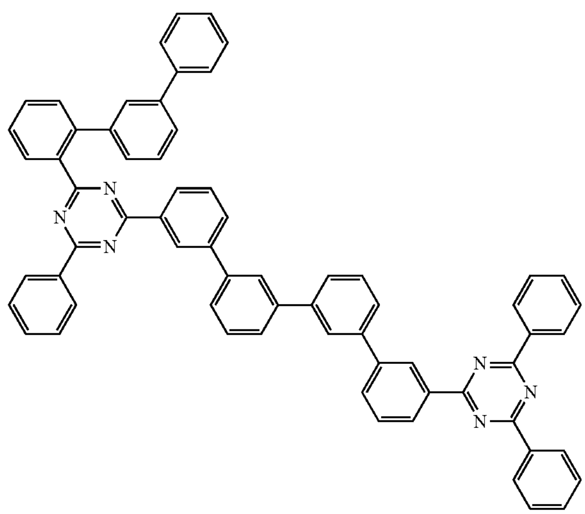

-continued
A(91)
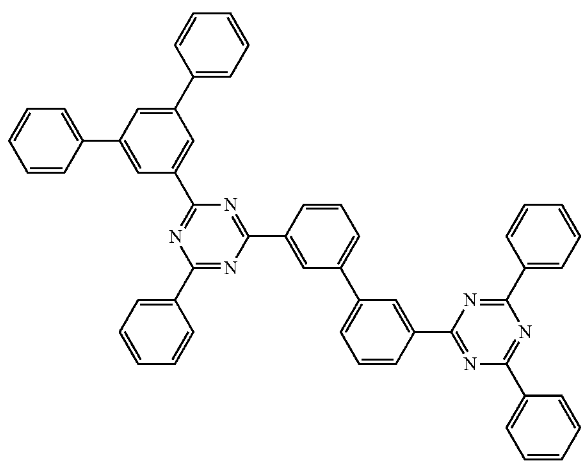
A(92)
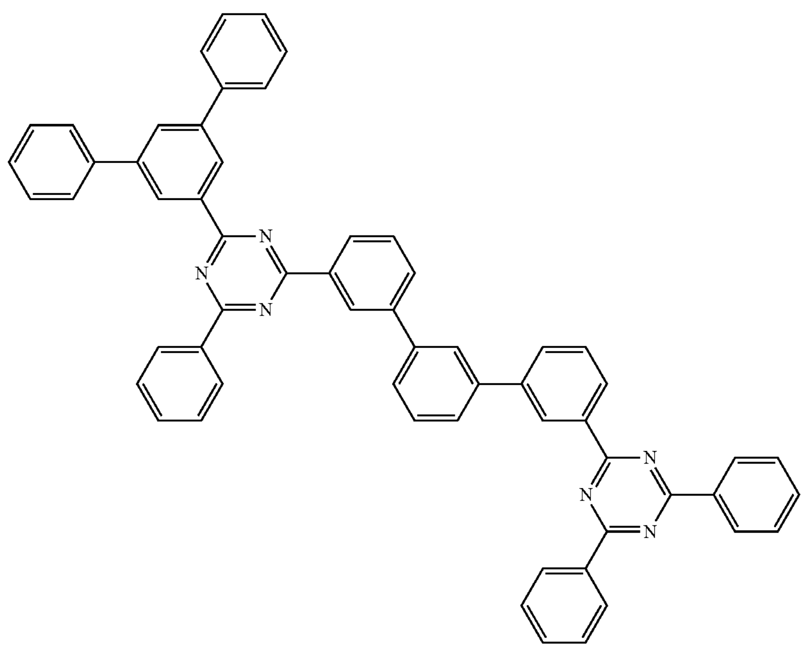

-continued
A(93)
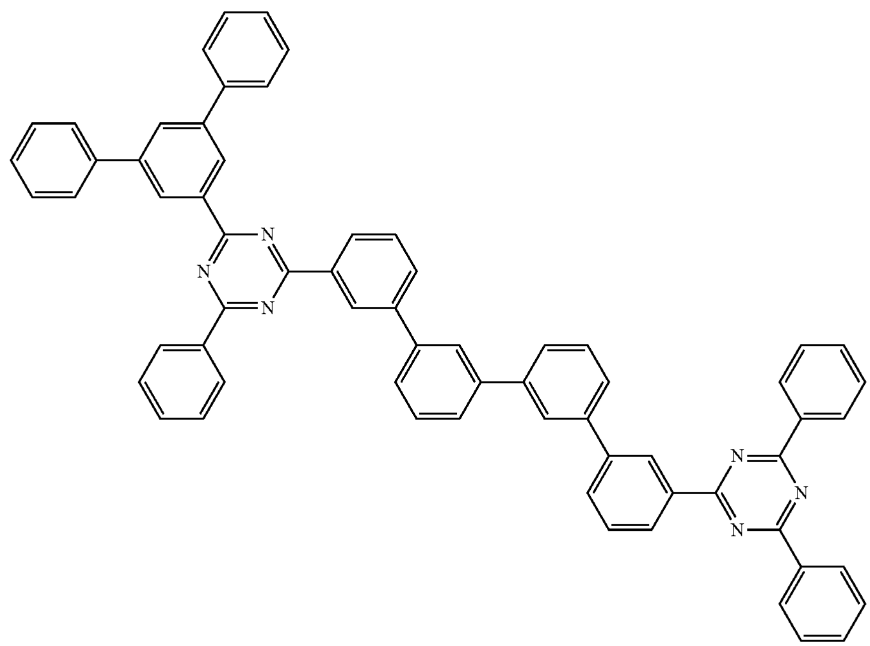
A(94)
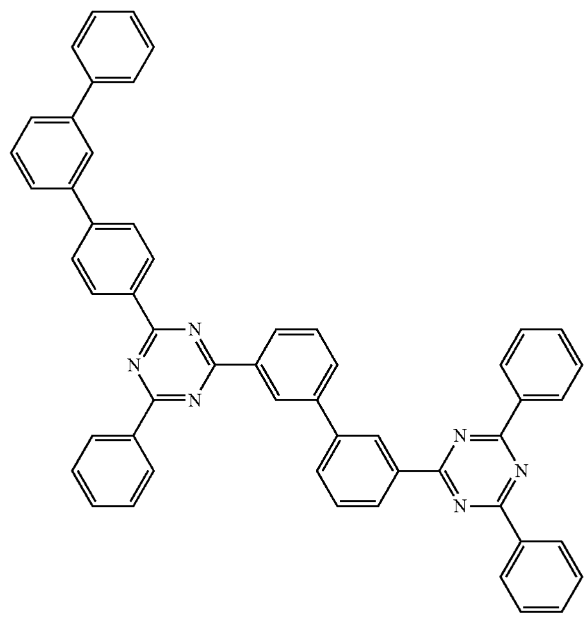

-continued
A(95)
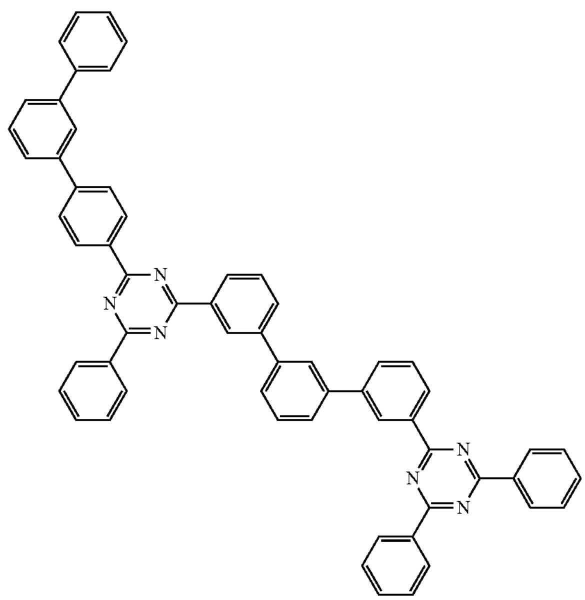
A(96)
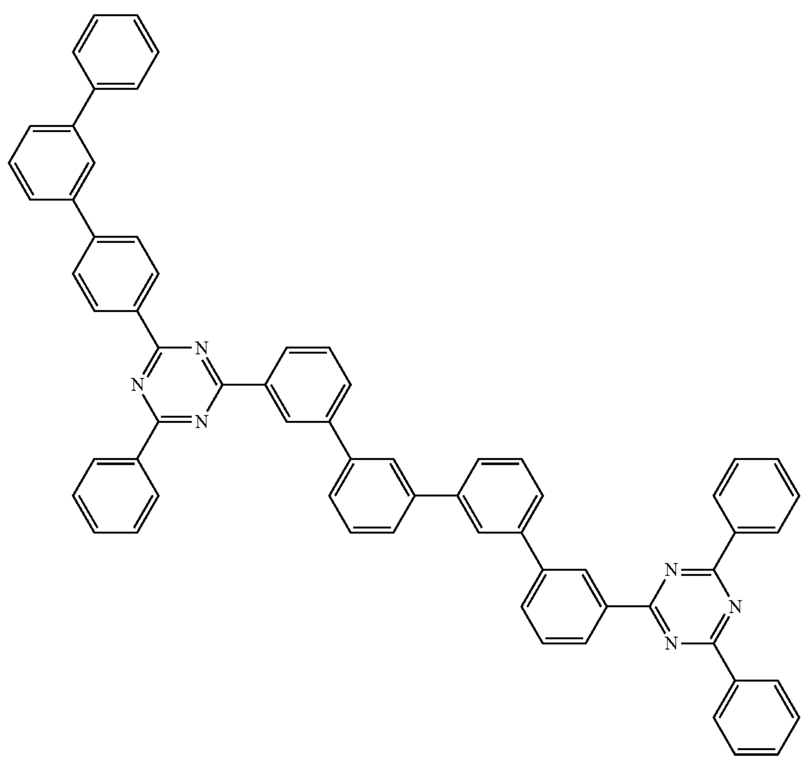

-continued
A(97)
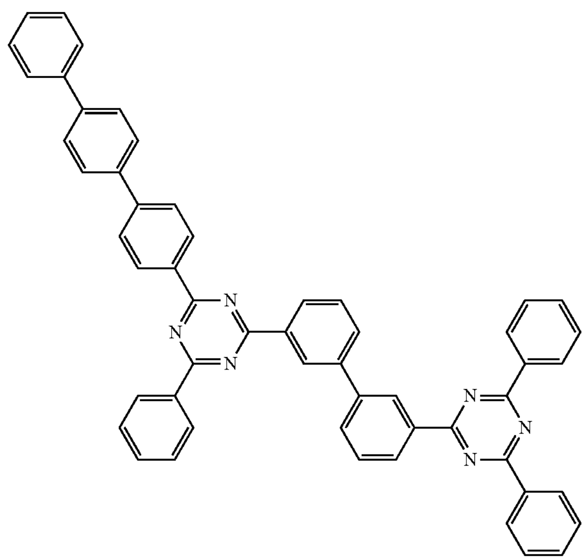
A(98)
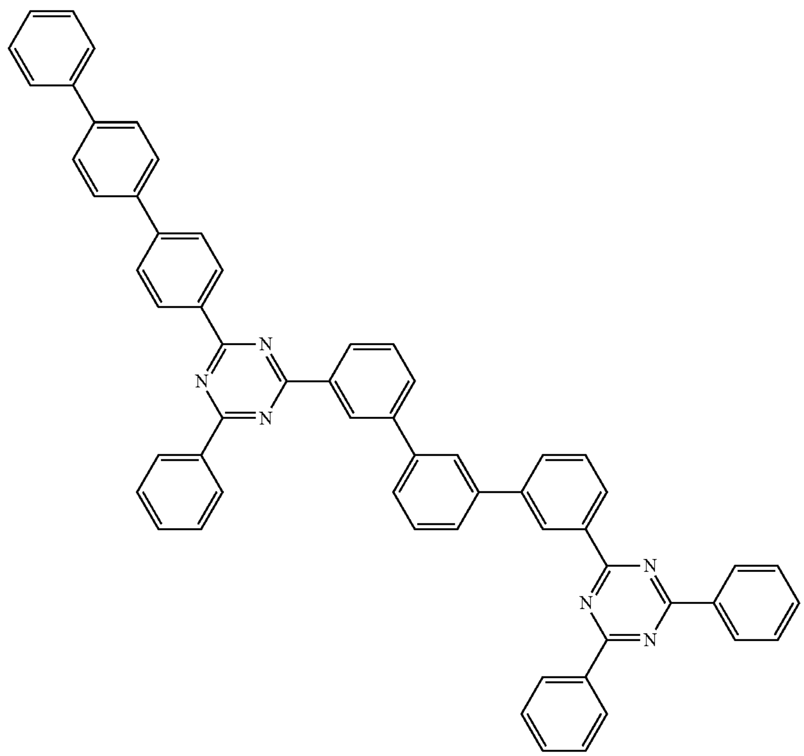

-continued
A(99)
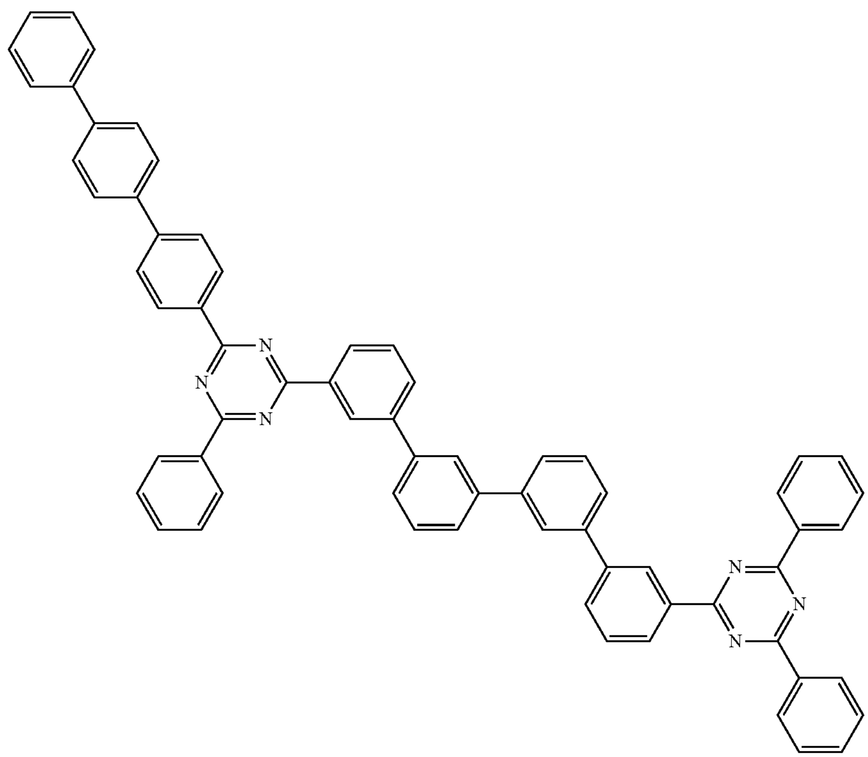
A(100)
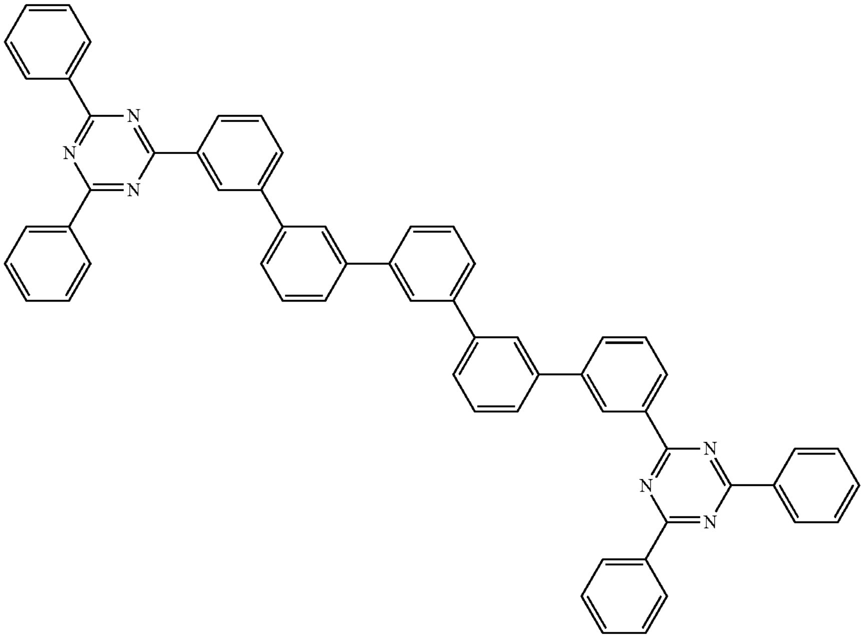

-continued
A(101)
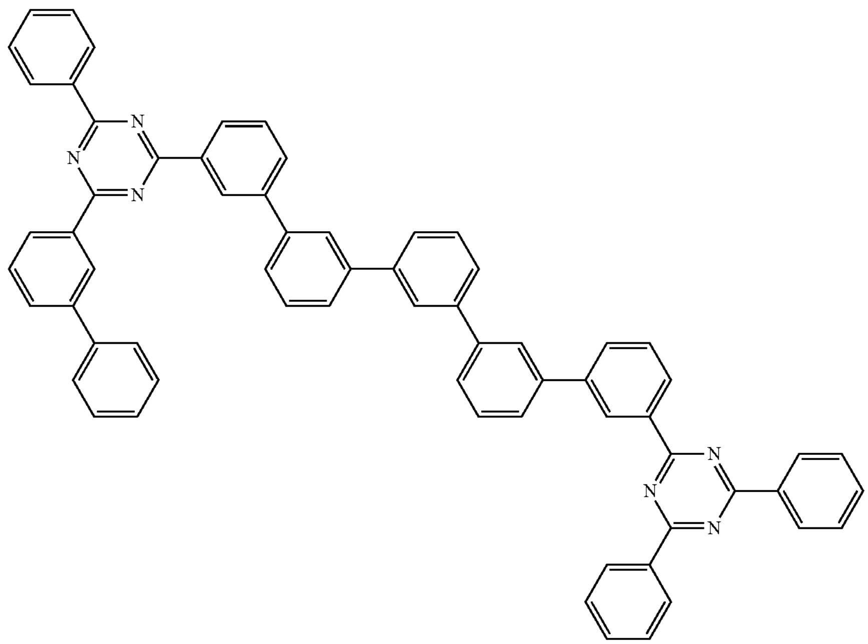
A(102)
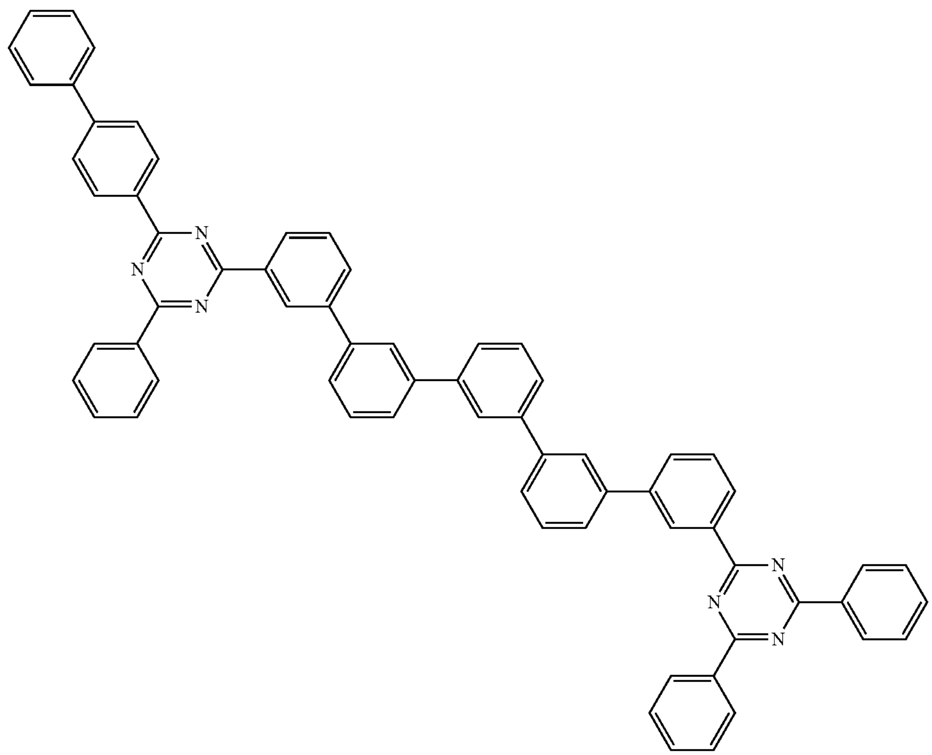

-continued
A(103)
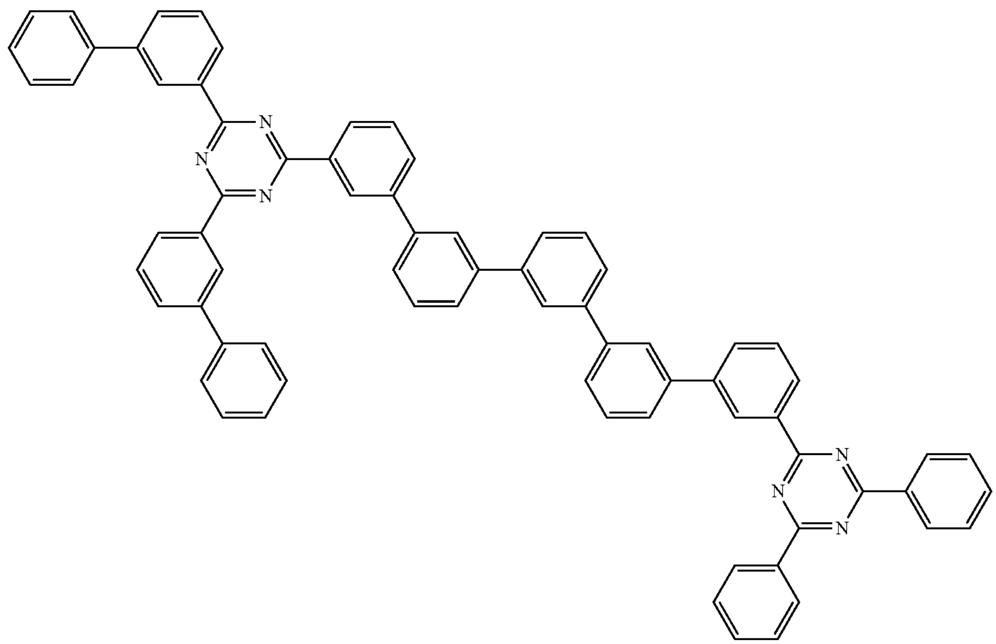
A(104)
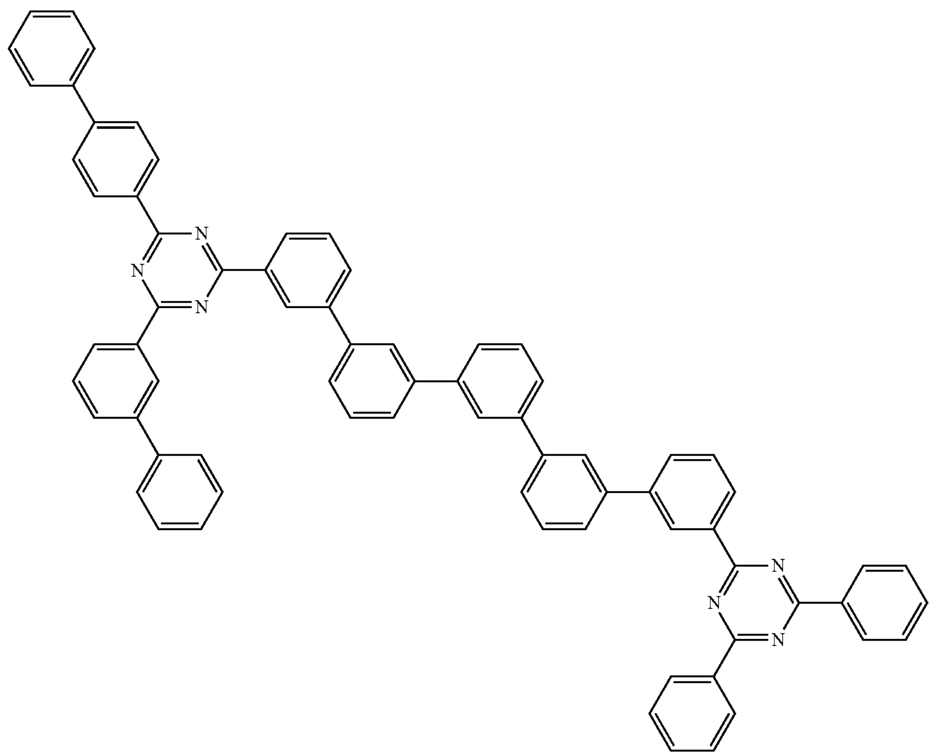

-continued
A(105)
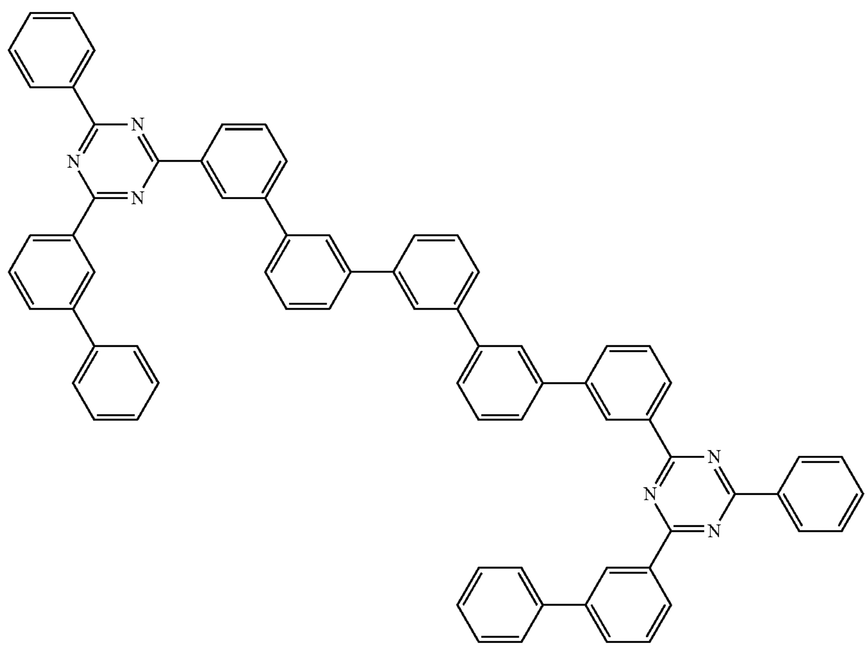
A(106)
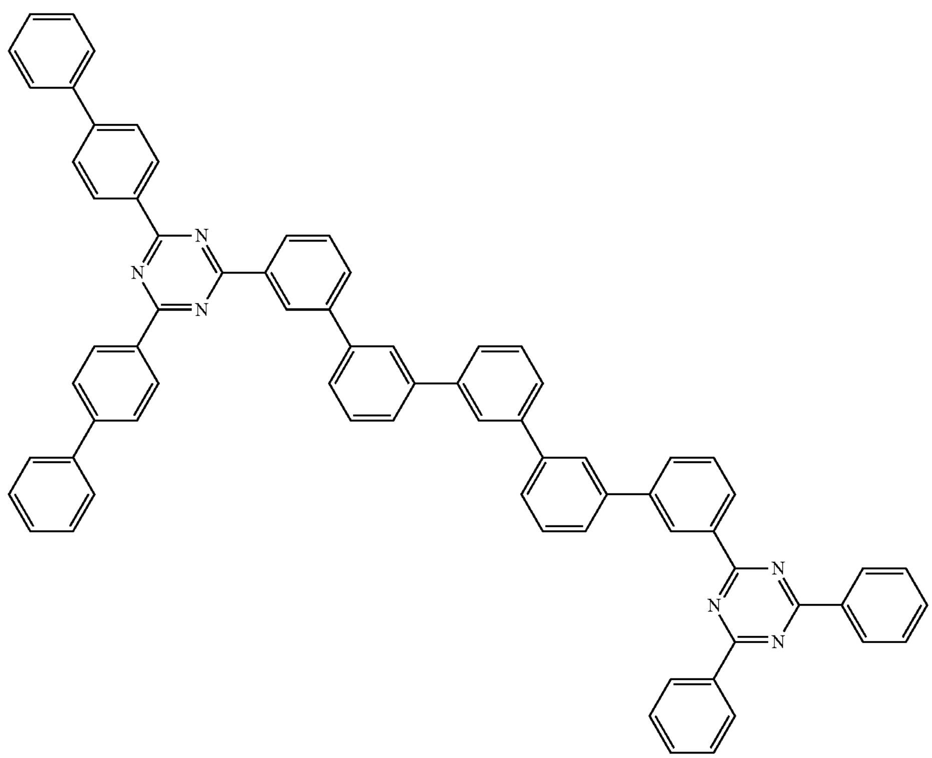

-continued
A(107)
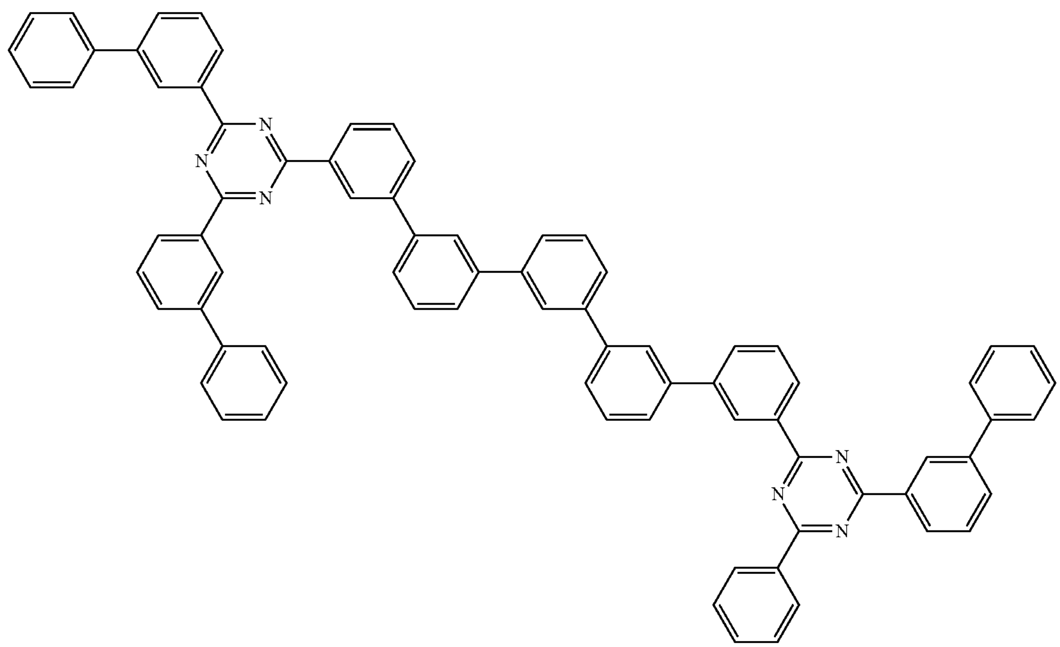
A(108)
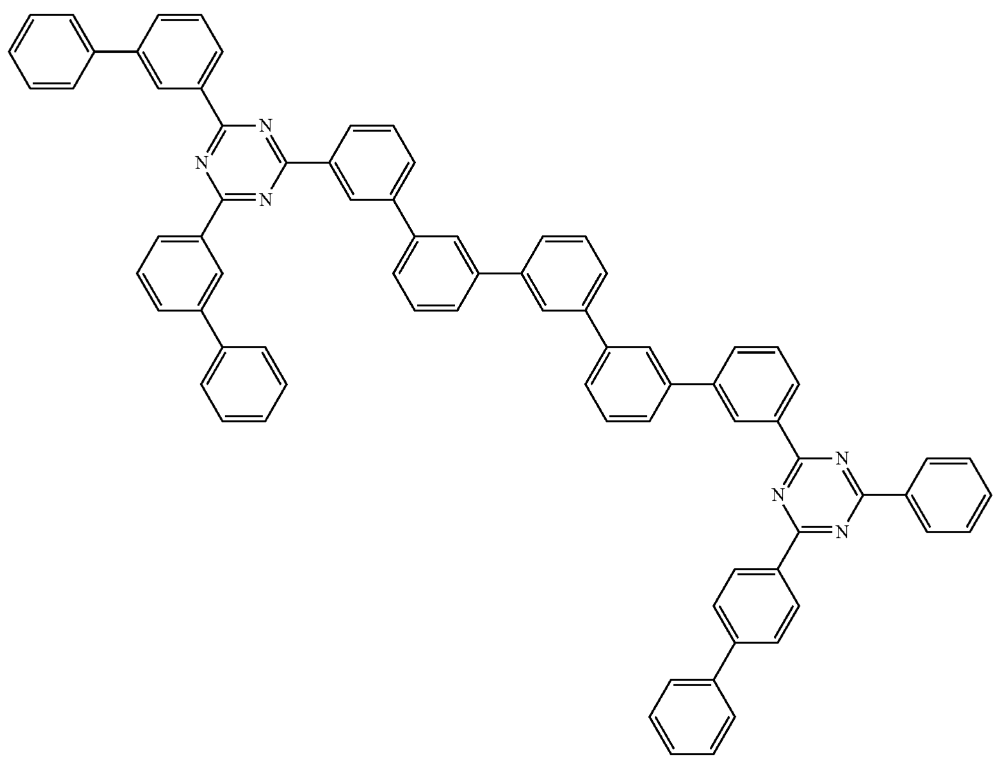

-continued
A(109)
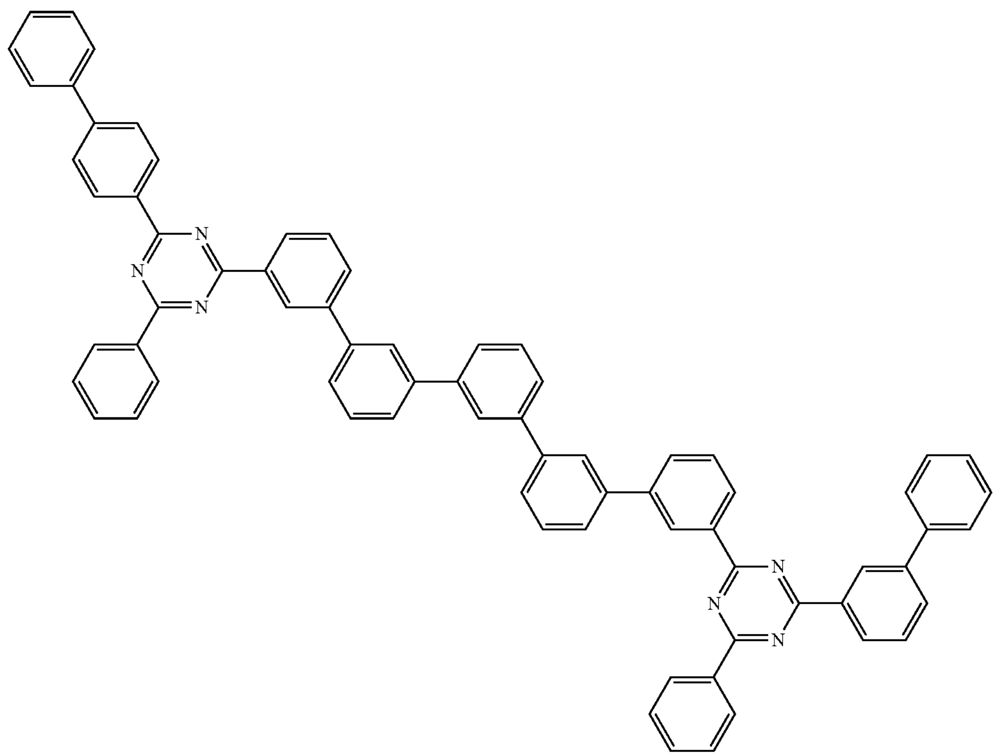
A(110)
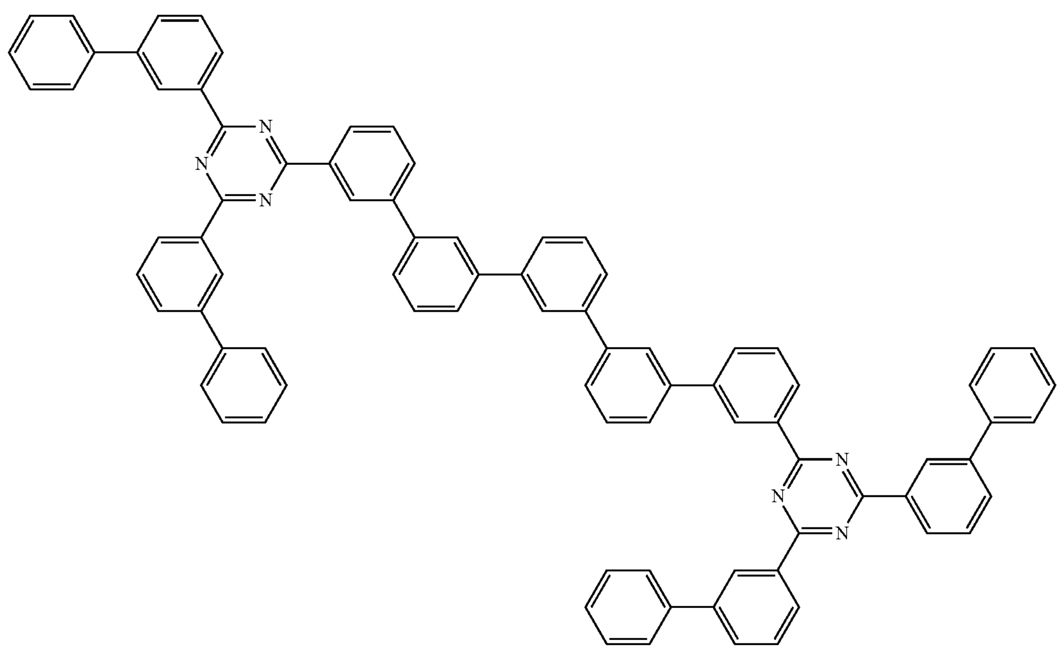

-continued
A(111)
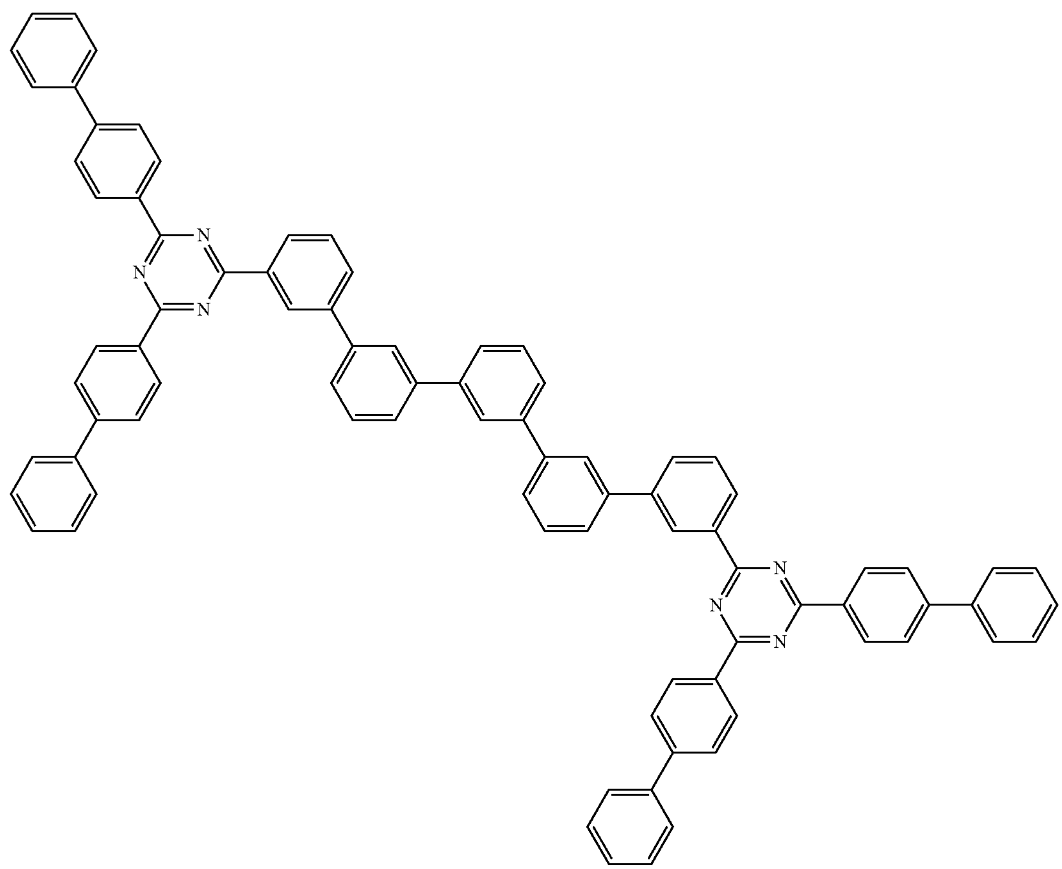
A(112)
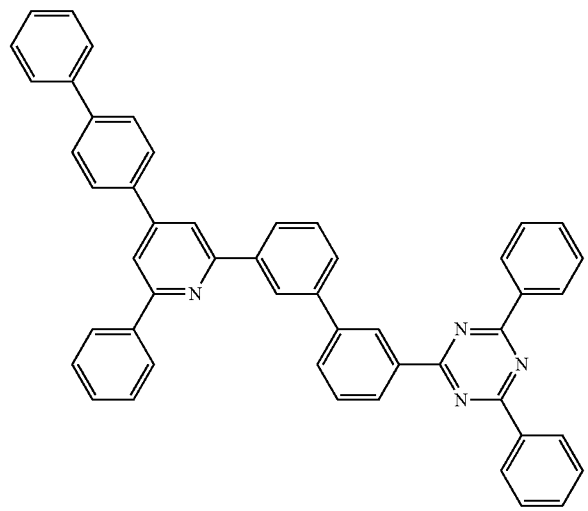

-continued
A(113)
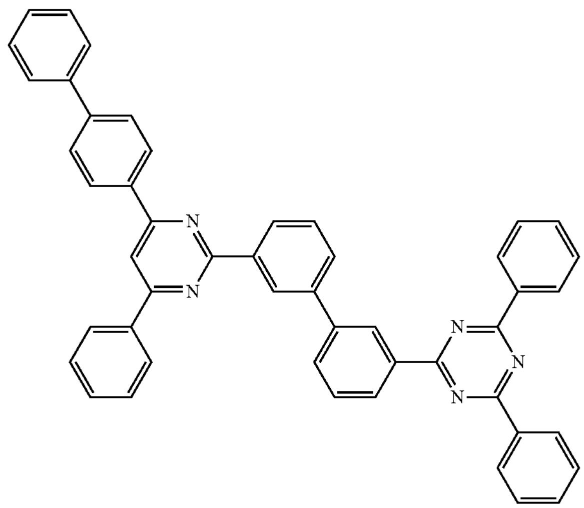
A(114)
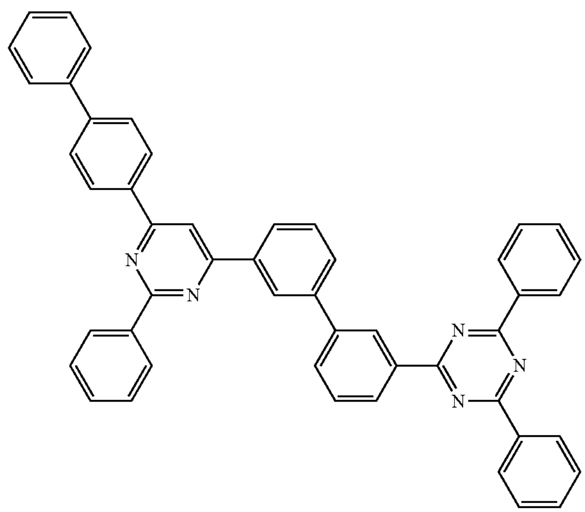
A(115)
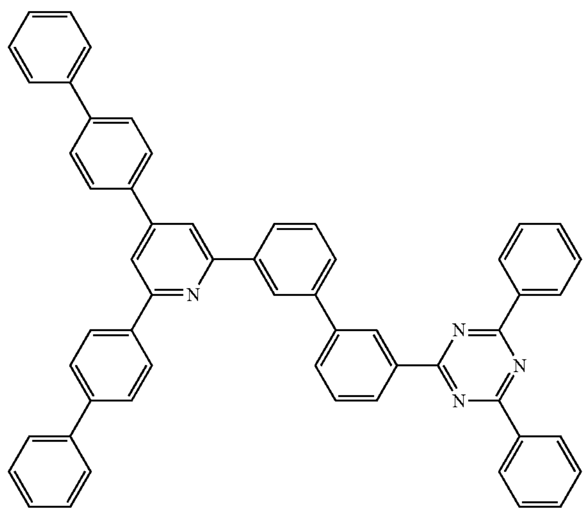

-continued
A(116)
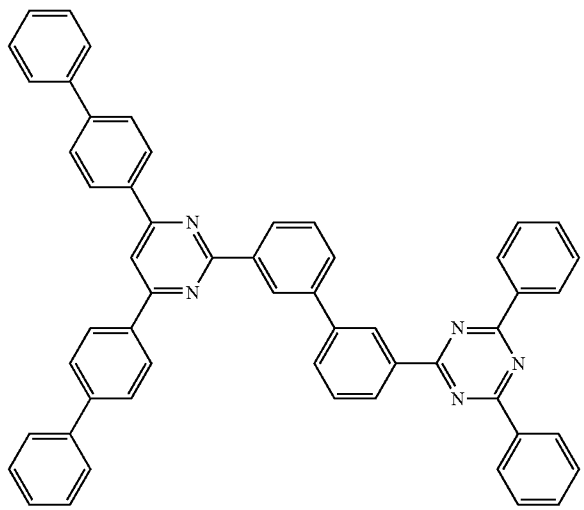
A(117)
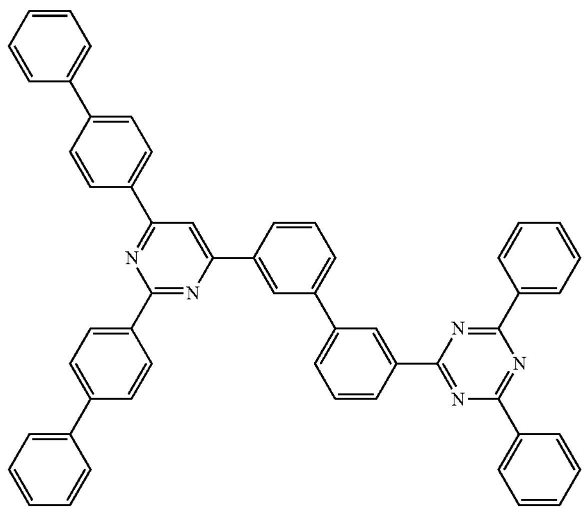
A(118)
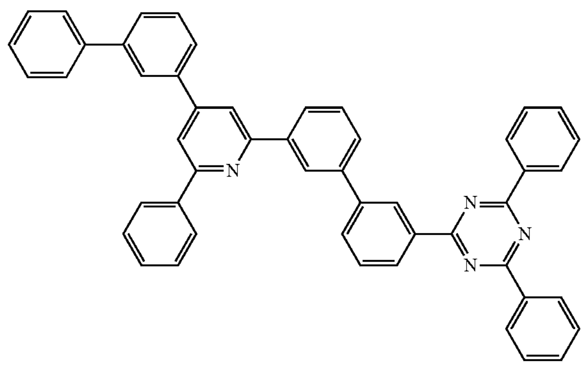

-continued
A(119)
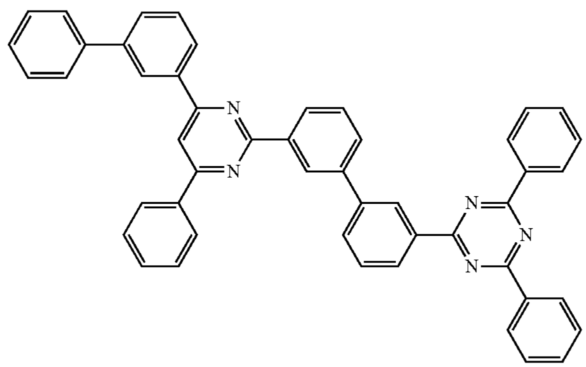
A(120)
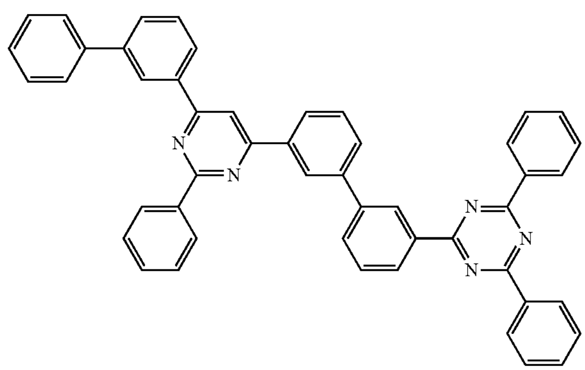
A(121)
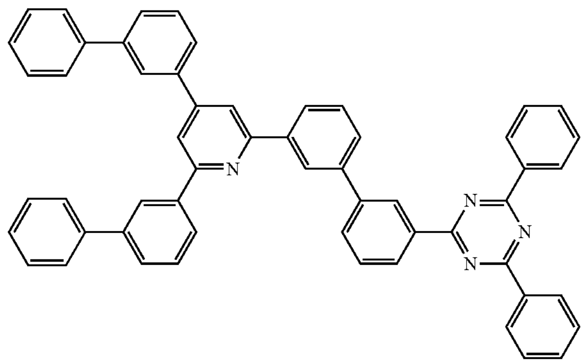
A(122)
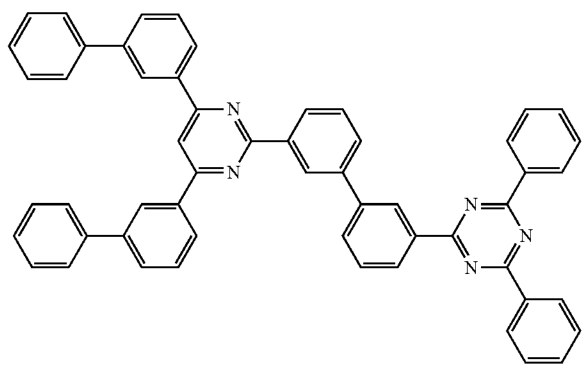

-continued
A(123)
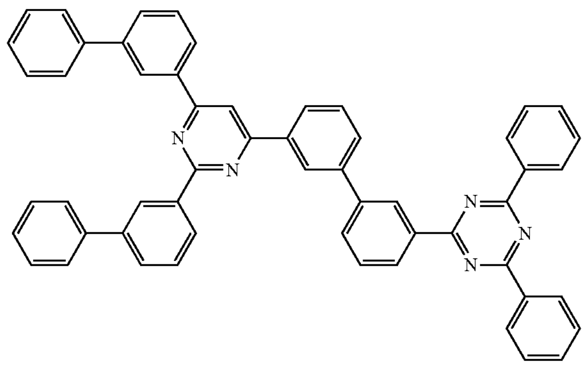
A(124)
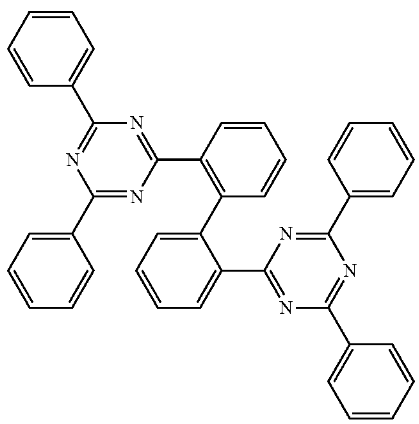
A(125)
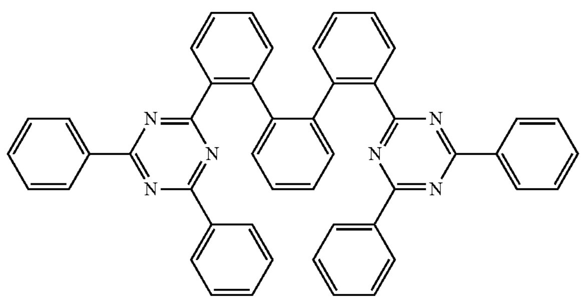
A(126)
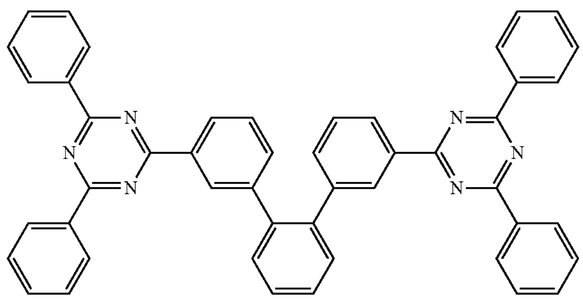

-continued
A(127)
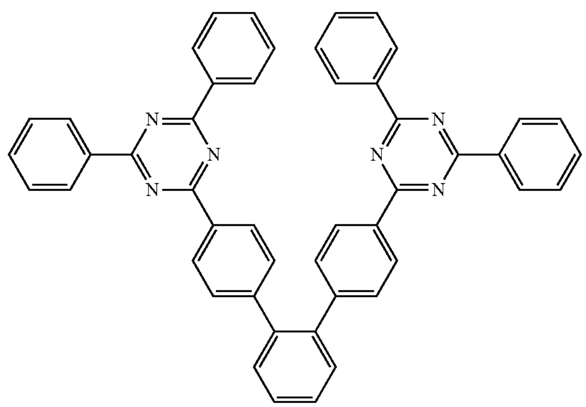
A(128)
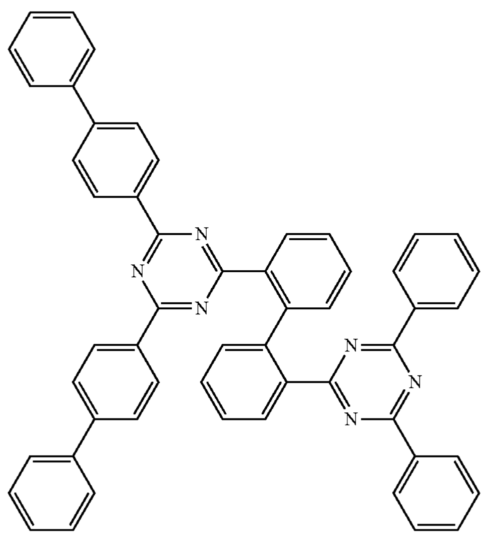
A(129)
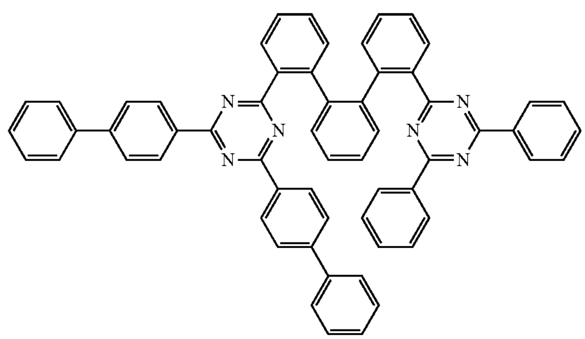

-continued
A(130)
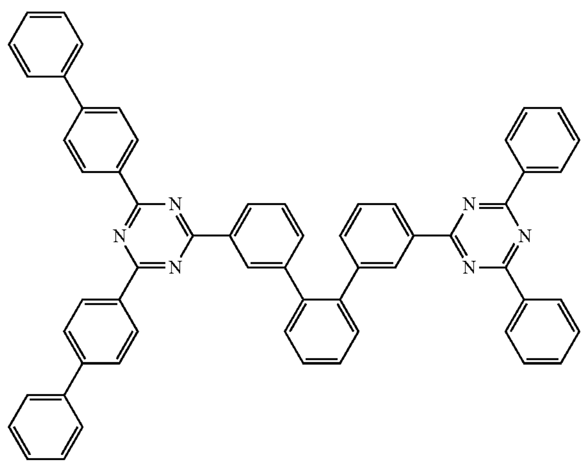
A(131)
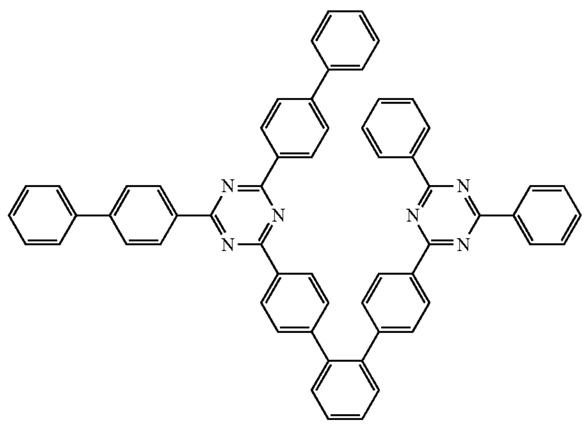
A(132)
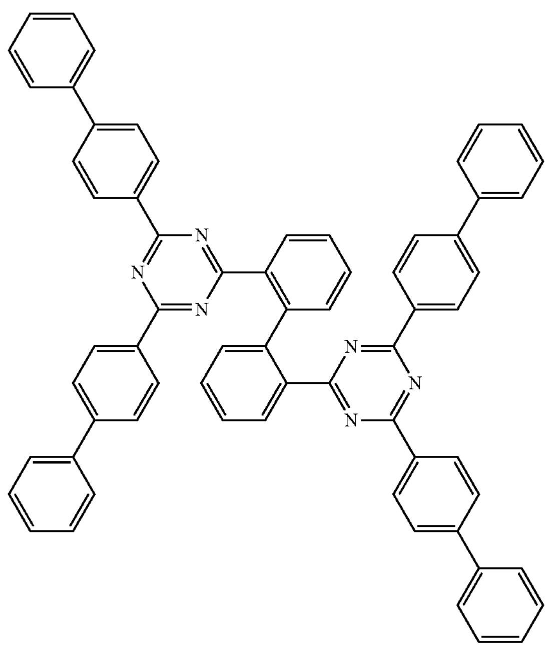

-continued
A(133)
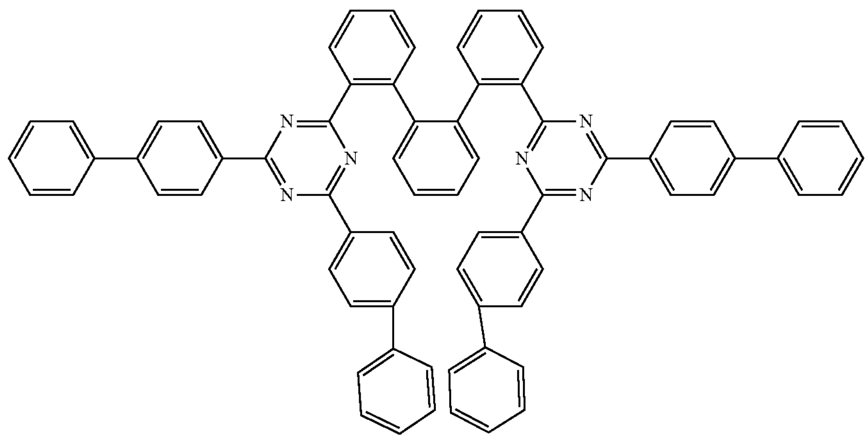
A(134)
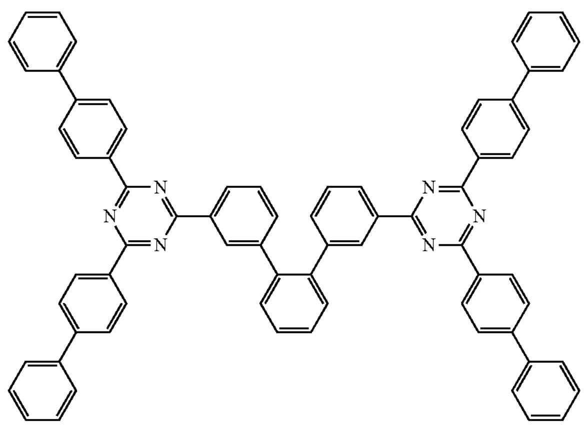
A(135)
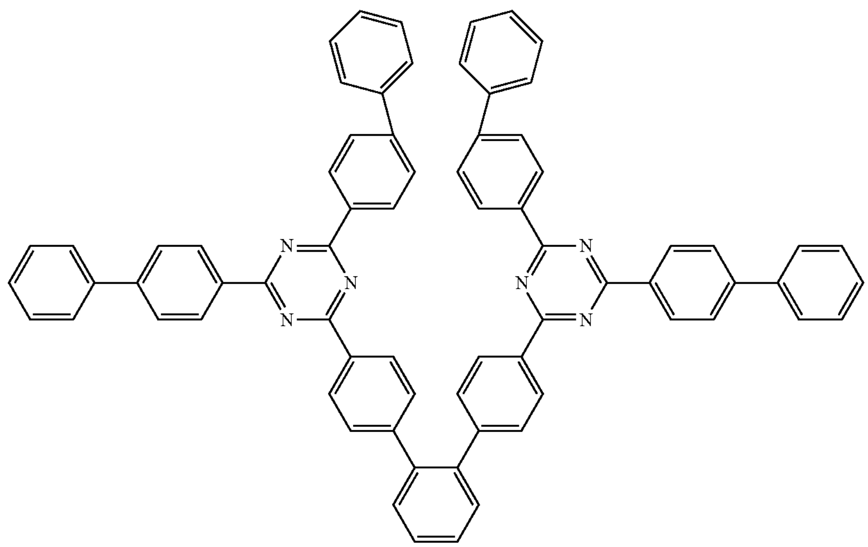

-continued
A(136)
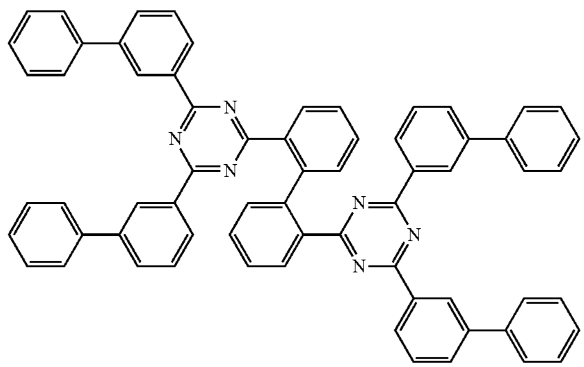
A(137)
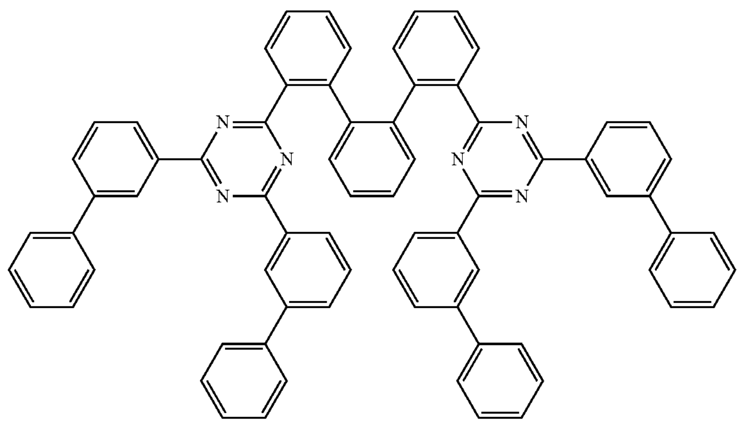
A(138)
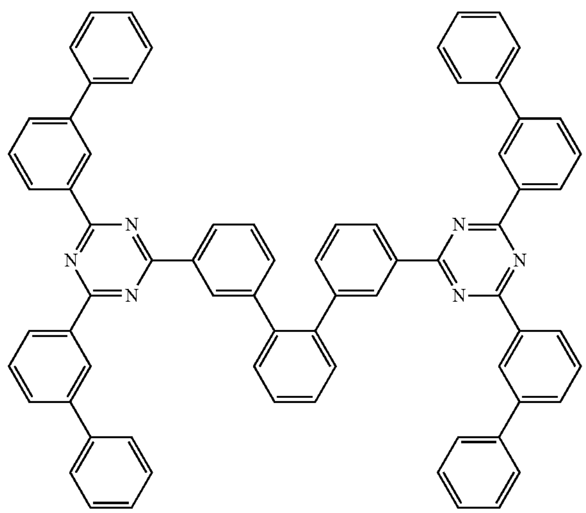

-continued
A(139)
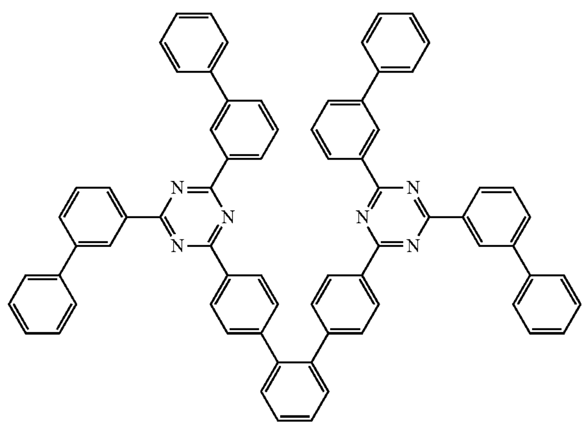
A(140)
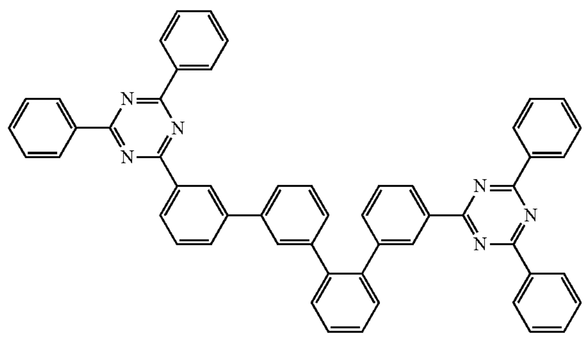
A(141)
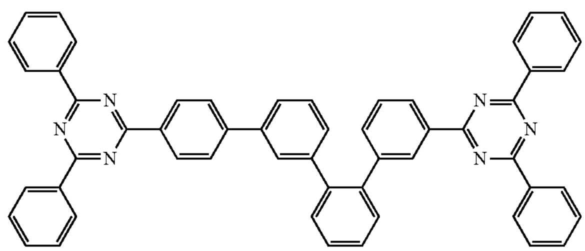
A(142)
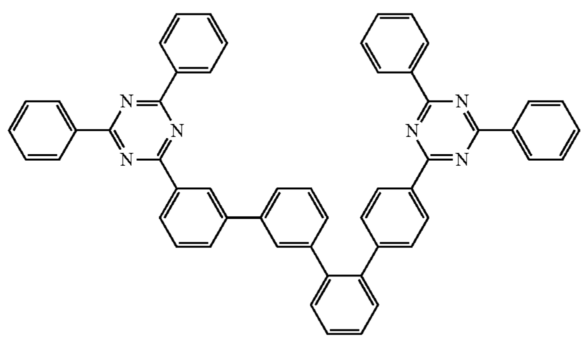

-continued
A(143)
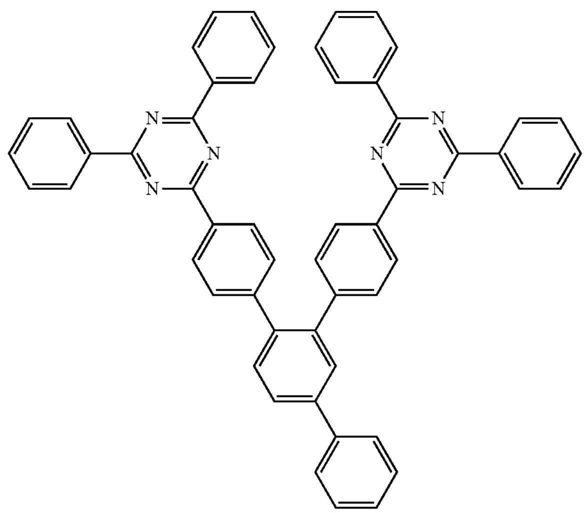
A(144)
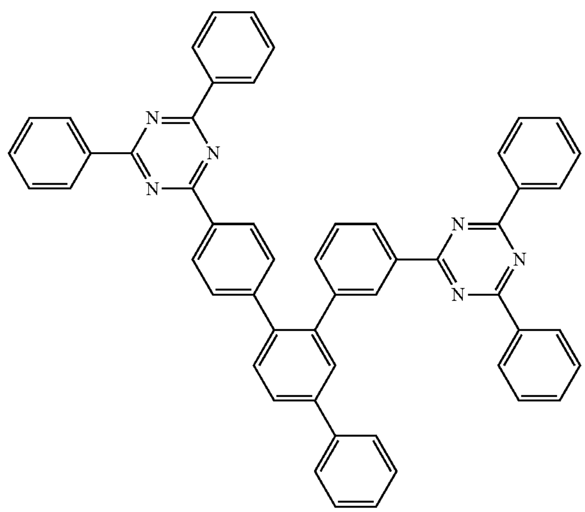
A(145)
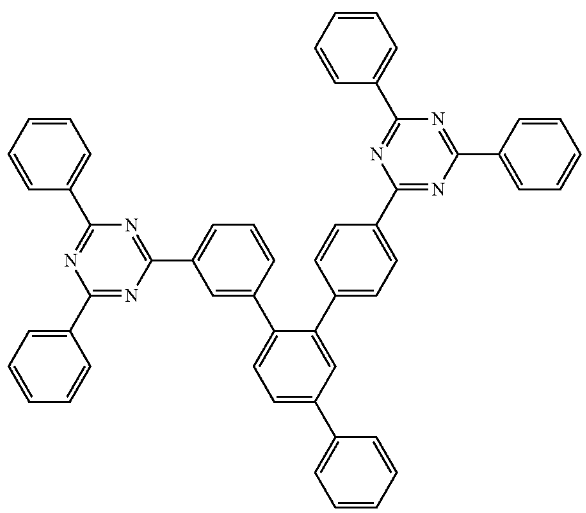

-continued
A(146)
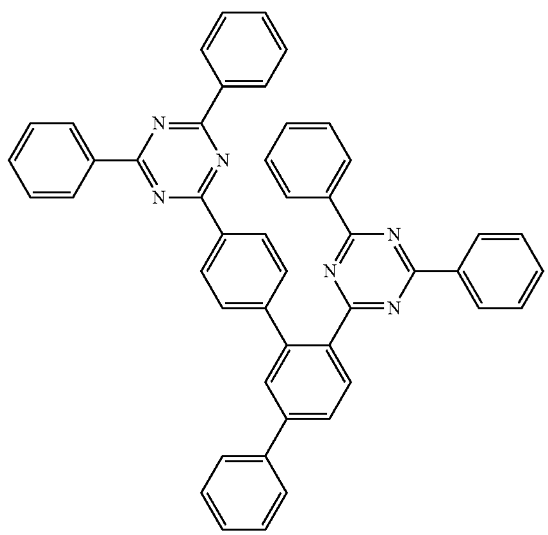
A(147)
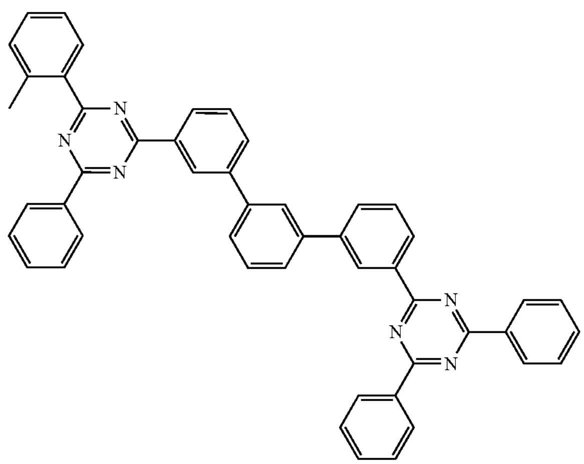
A(148)
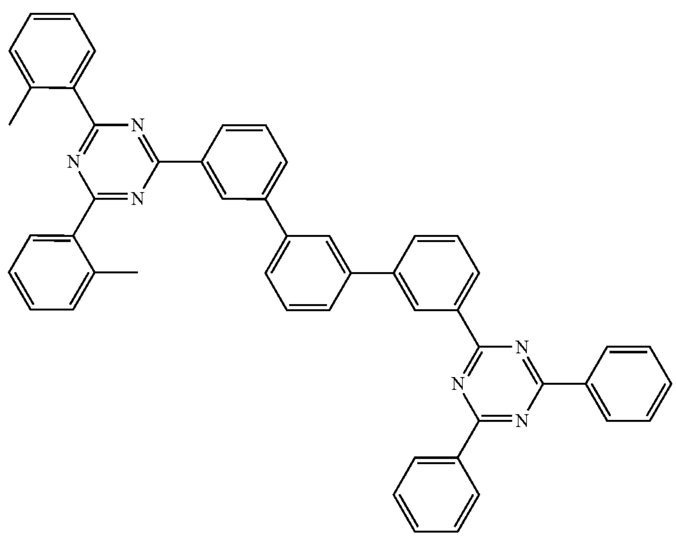

-continued
A(149)
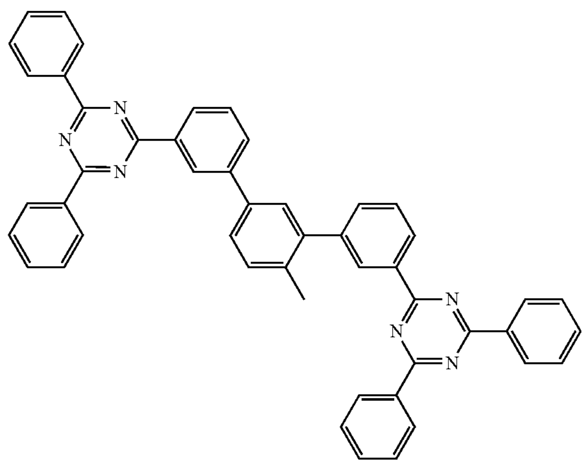
A(150)
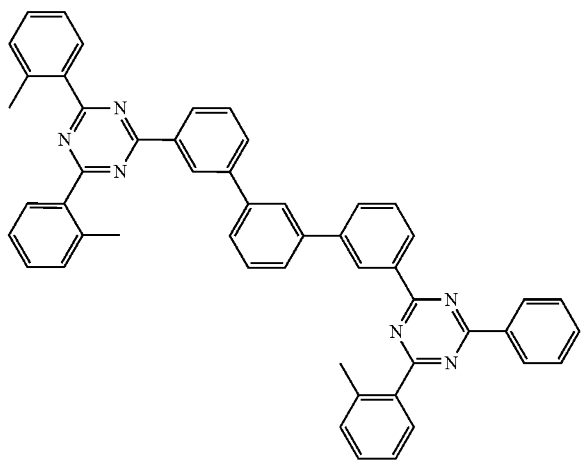
A(151)
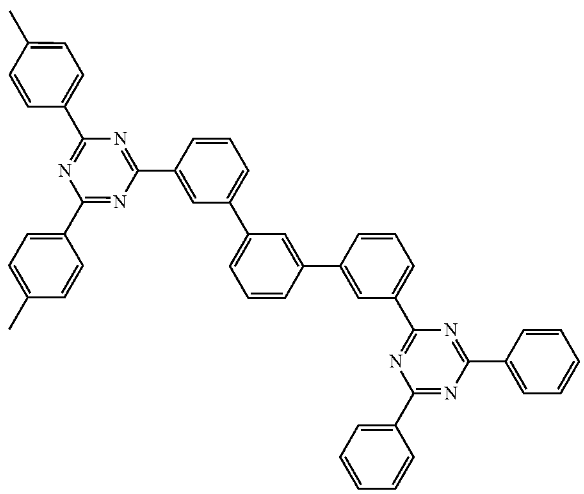

-continued
A(152)
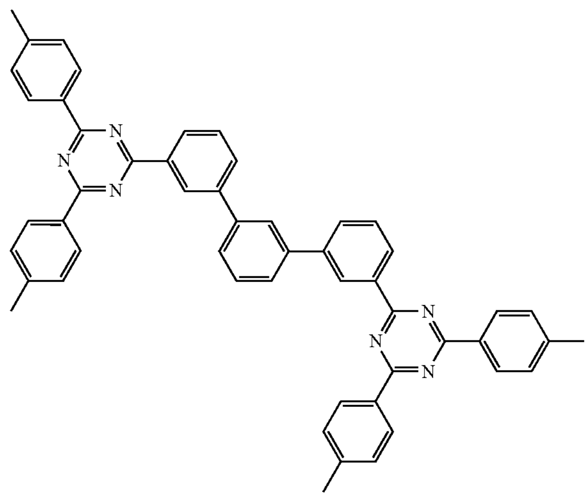
A(153)
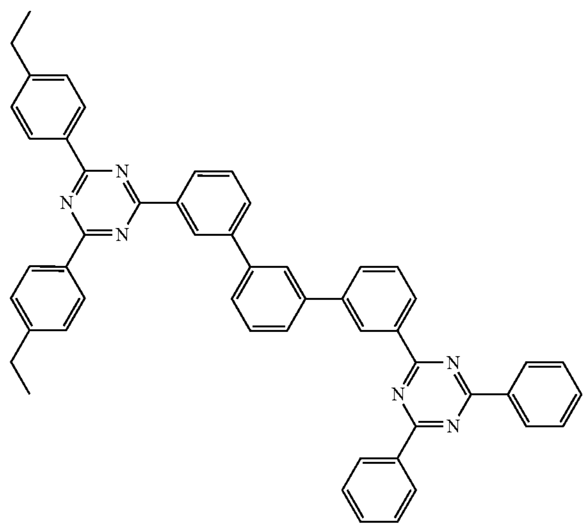
A(154)
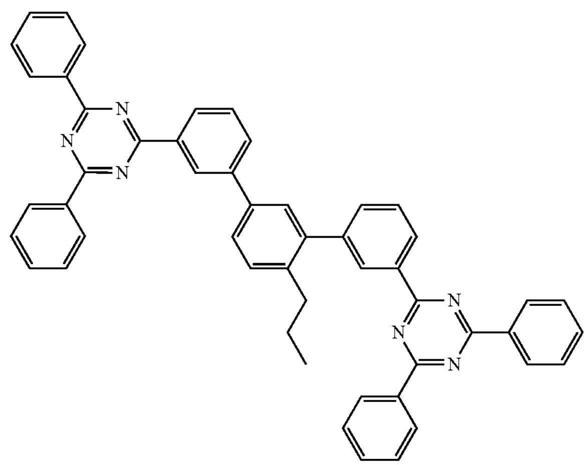

Group HE2
1
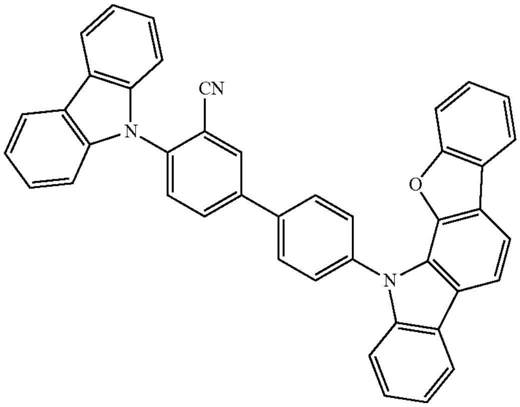
2
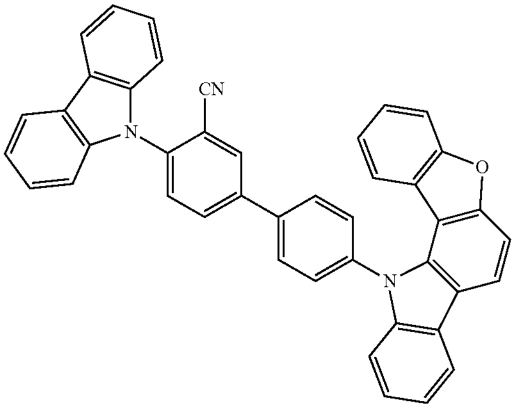
3
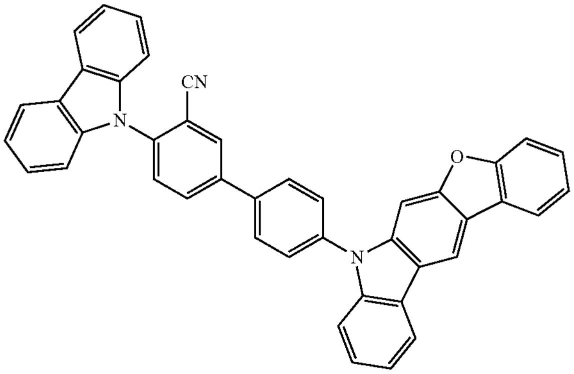
-continued
4
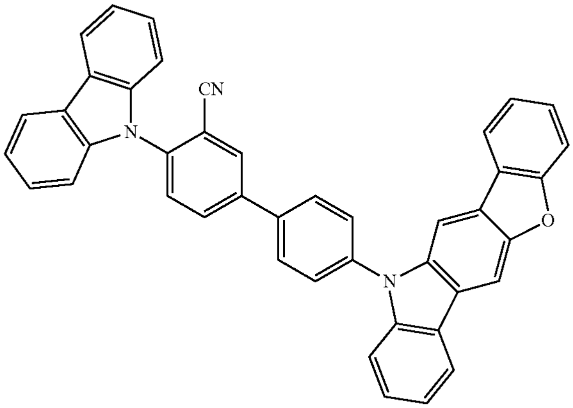
5
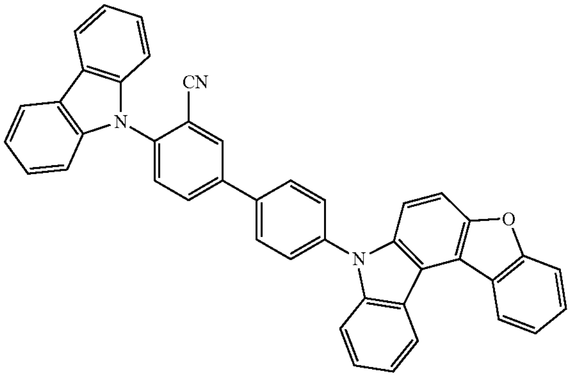
6
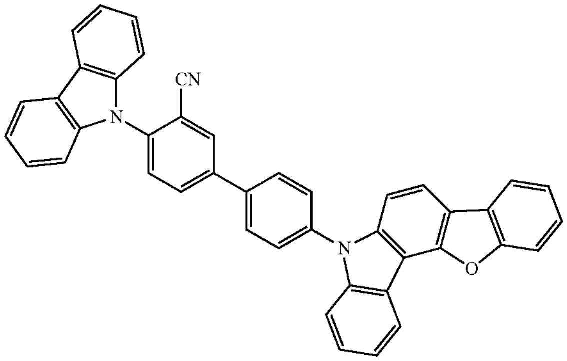
7
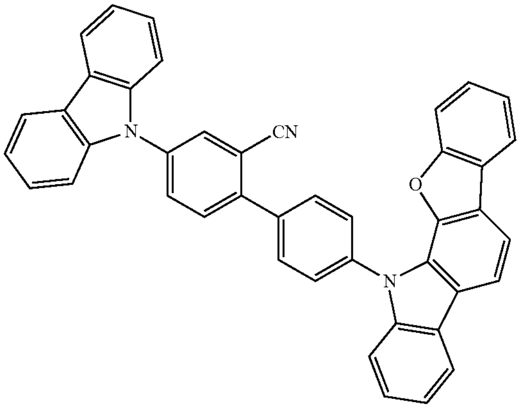

-continued
8
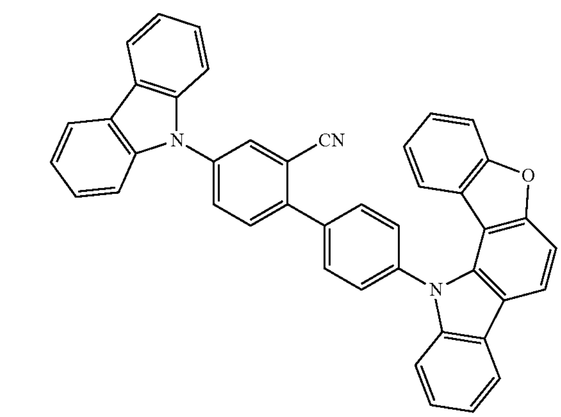
9
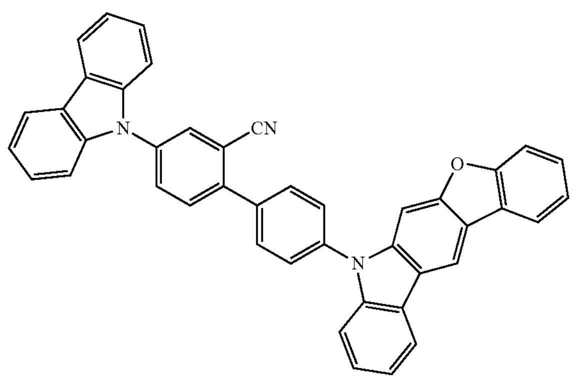
10
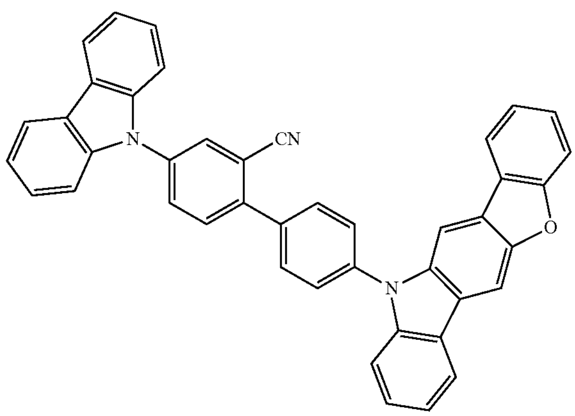
11
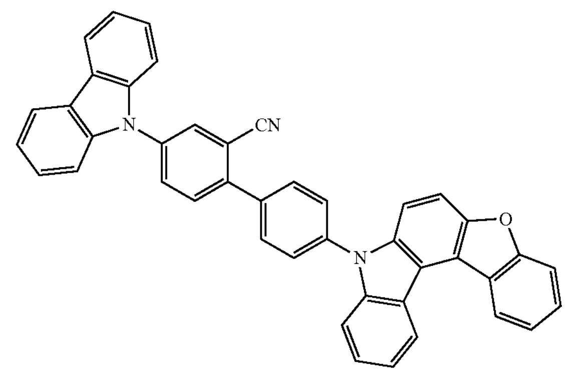
-continued
12
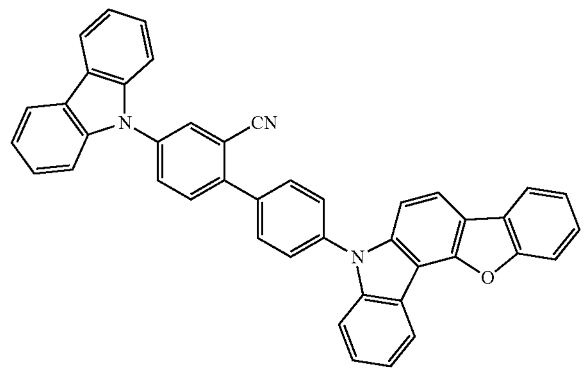
13
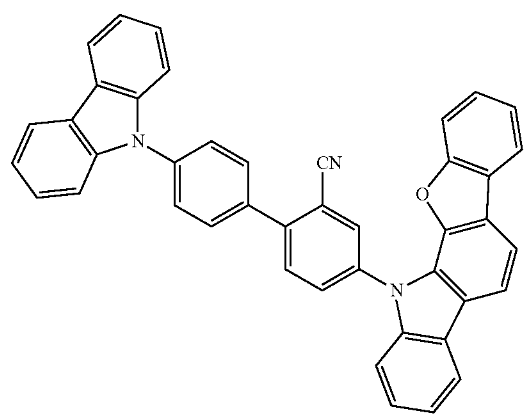
14
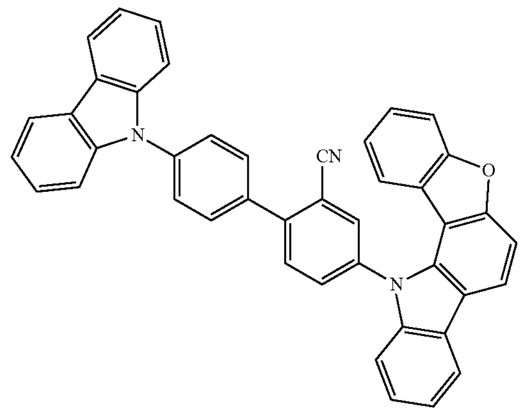
15
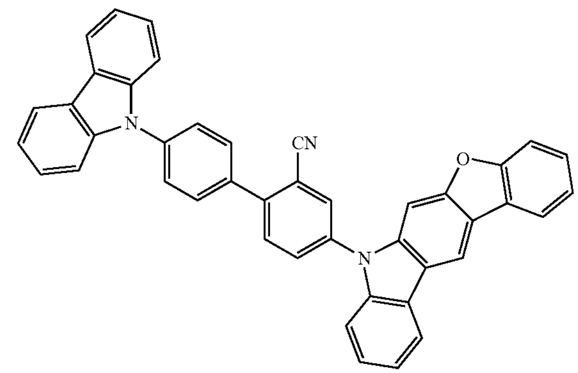

-continued
16
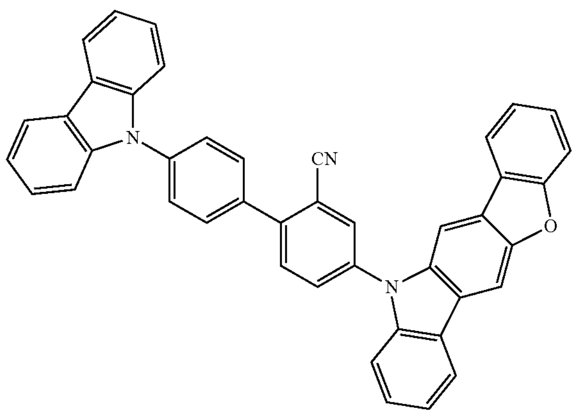
17
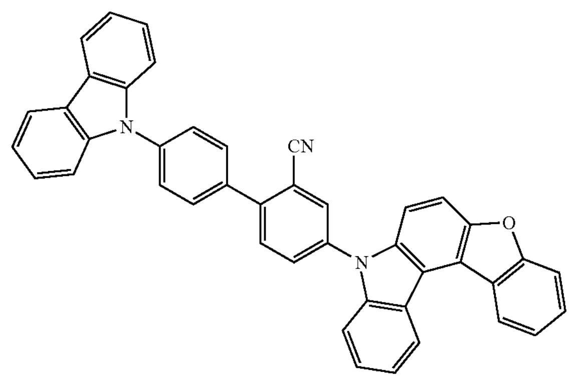
18
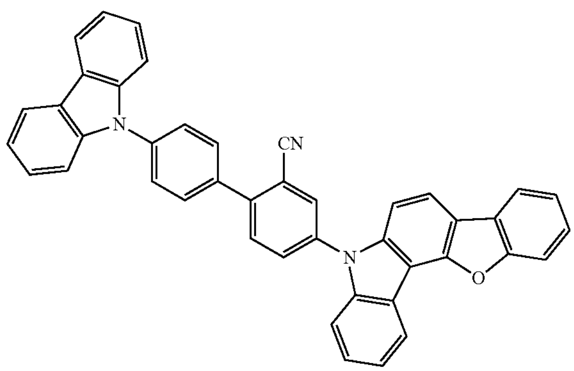
19
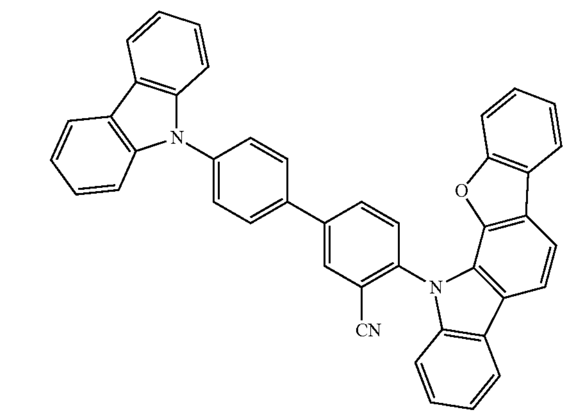
-continued
20
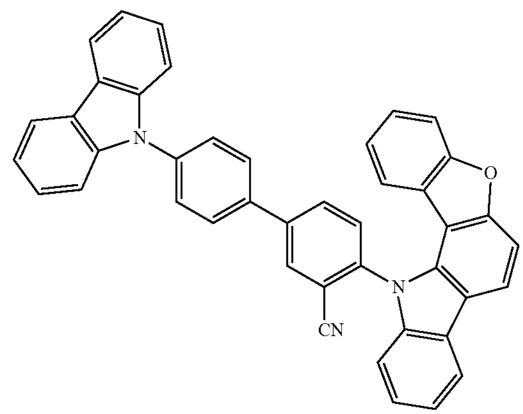
21
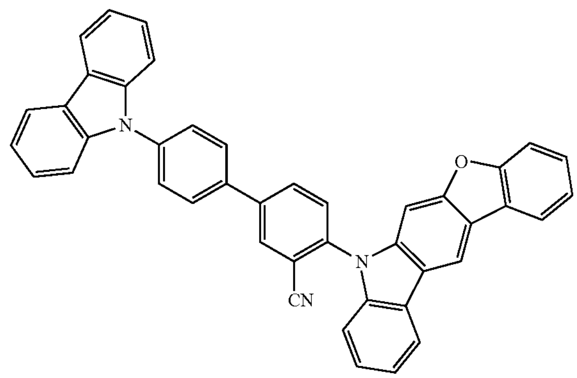
22
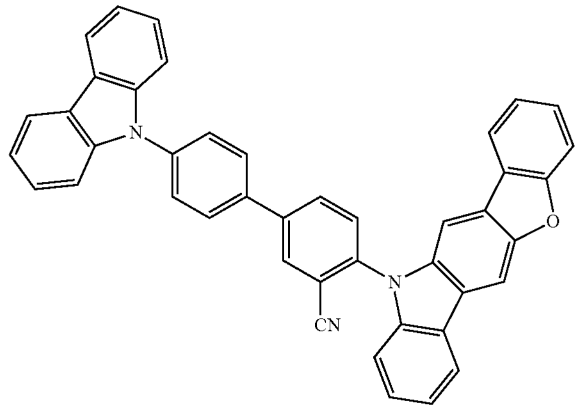
23
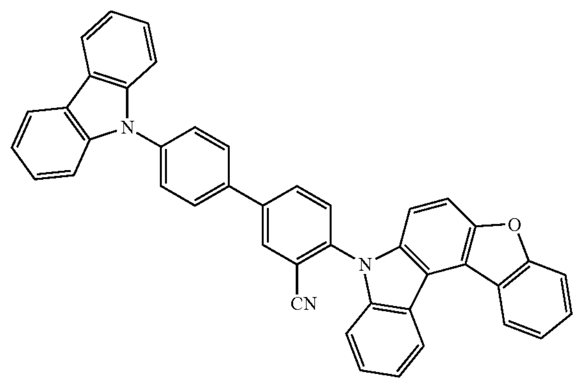

-continued
24
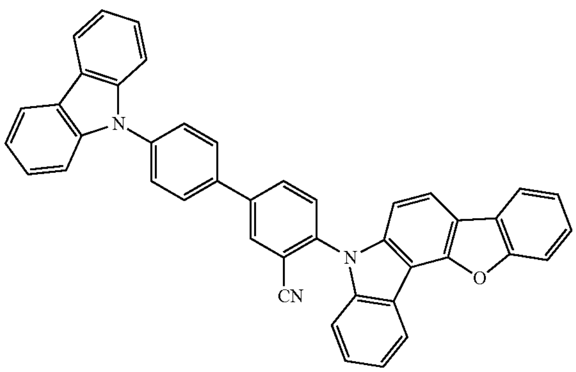
25
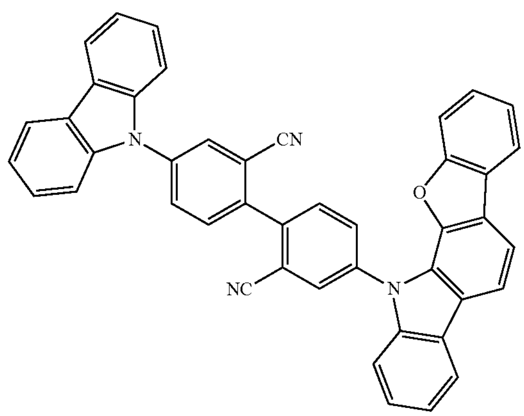
26
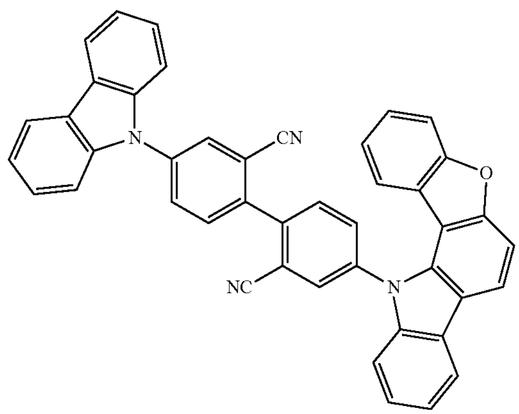
27
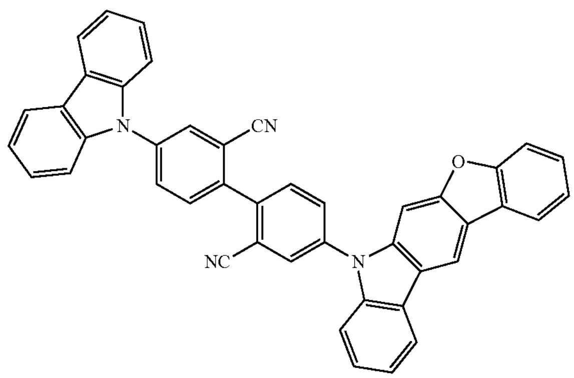
-continued
28
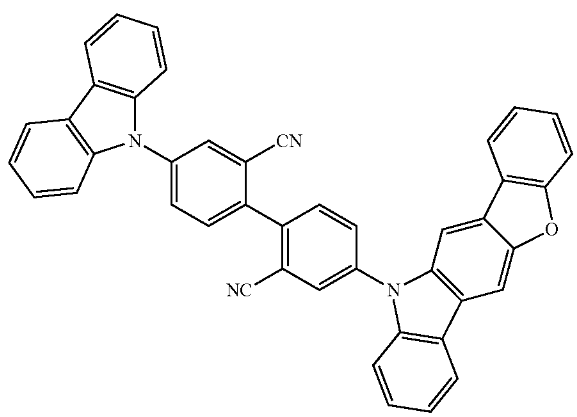
29
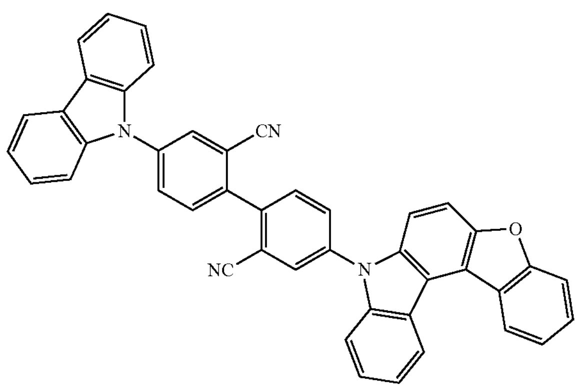
30
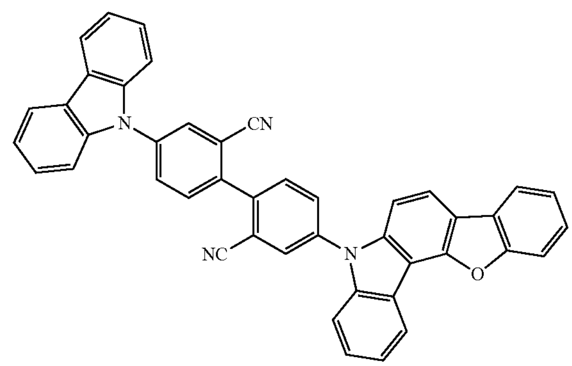
31
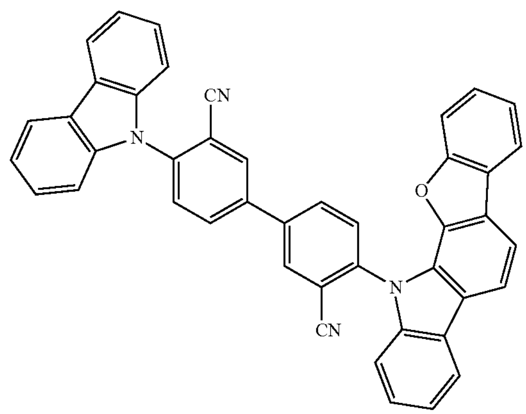

-continued
32
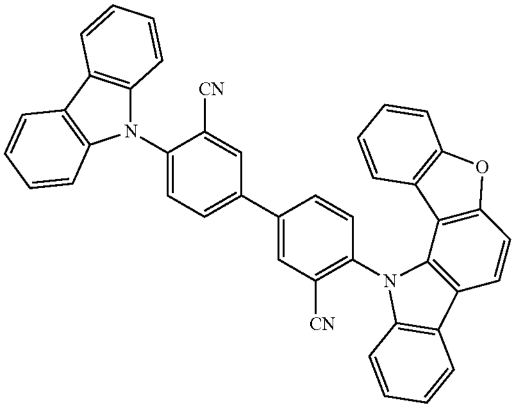
33
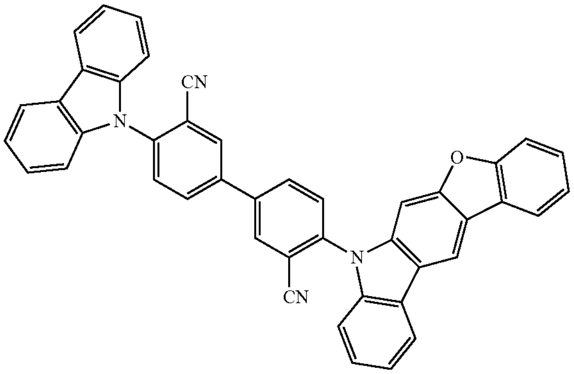
34
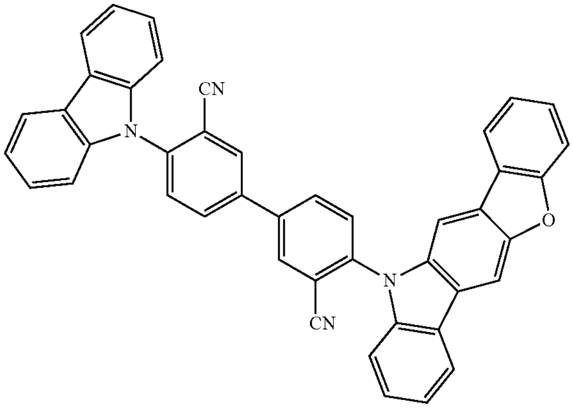
-continued
35
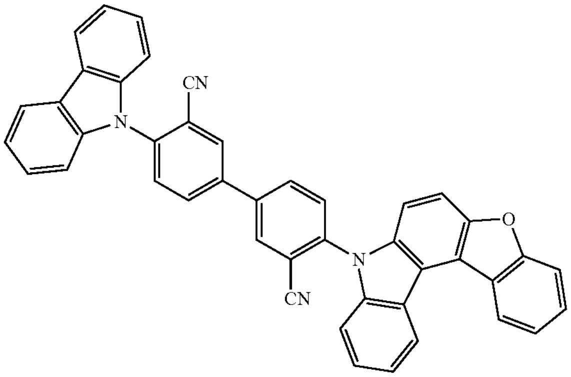
36
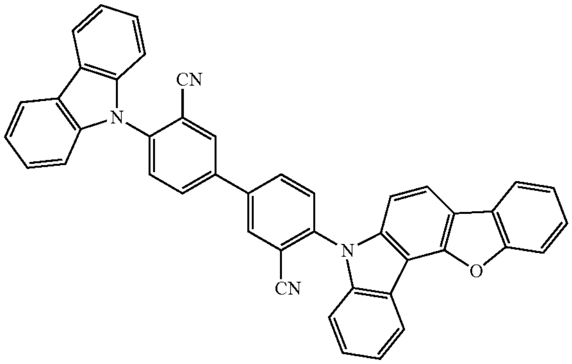
37
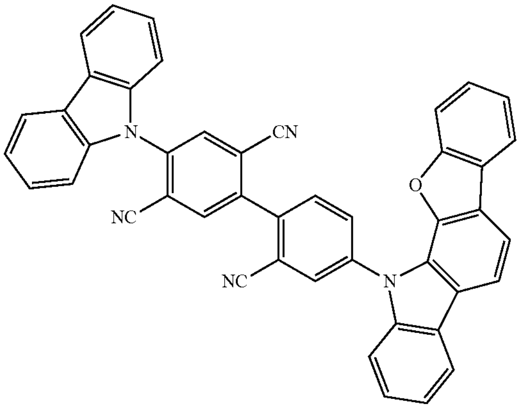
38
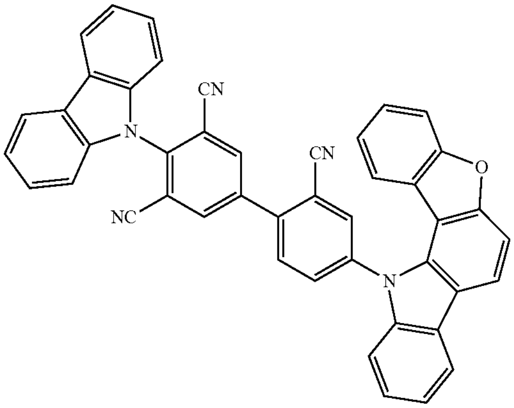

-continued
39
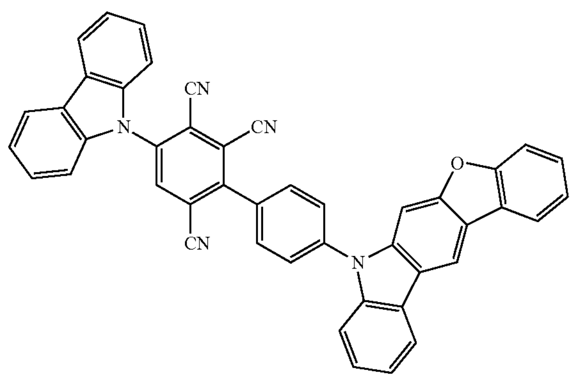
40
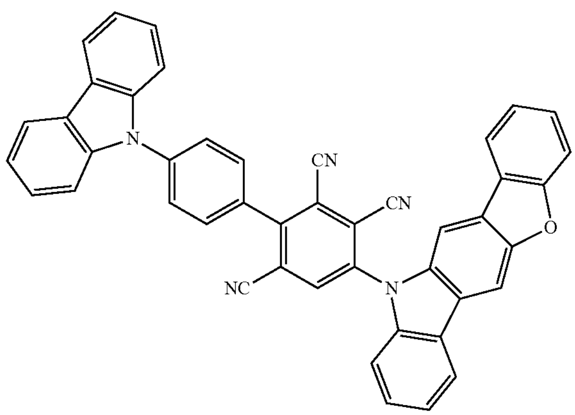
41
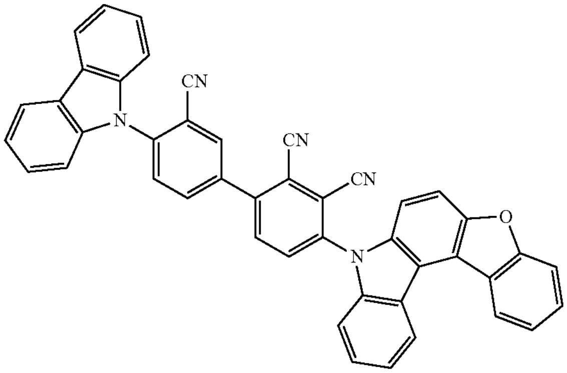
42
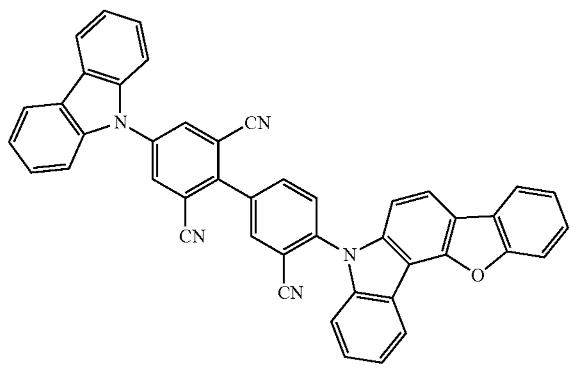
-continued
43
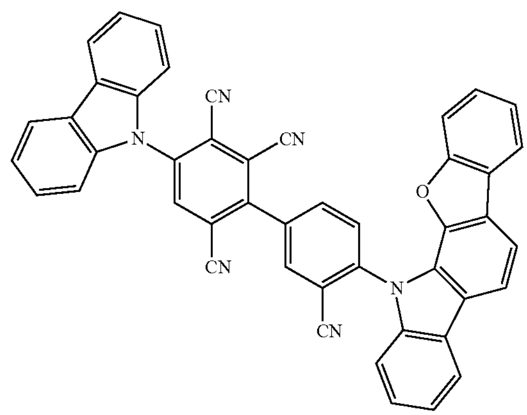
44
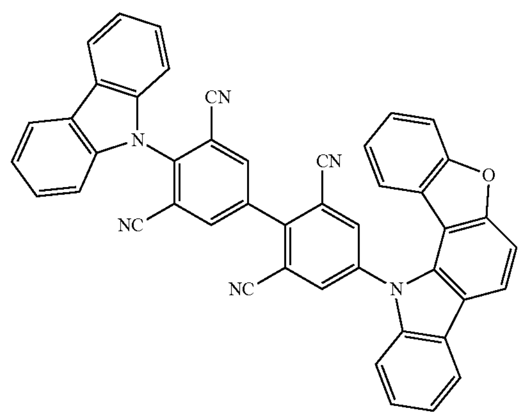
45
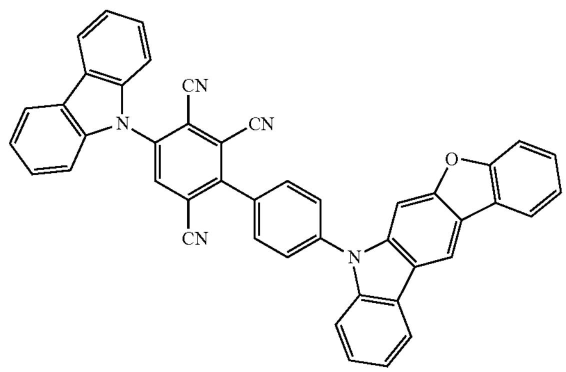

-continued
46
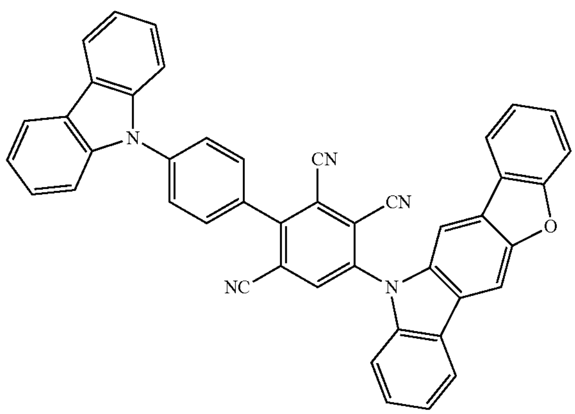
47
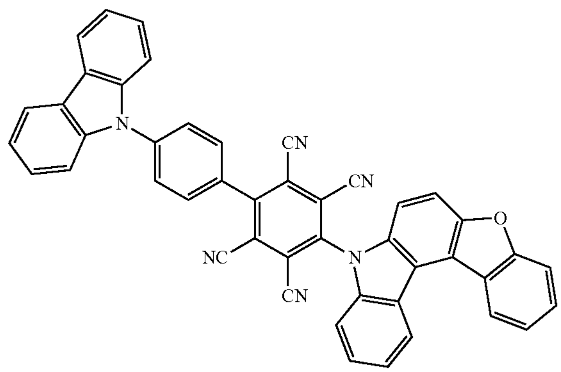
48
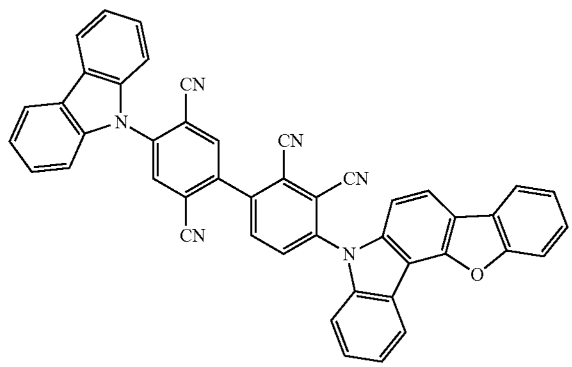
49
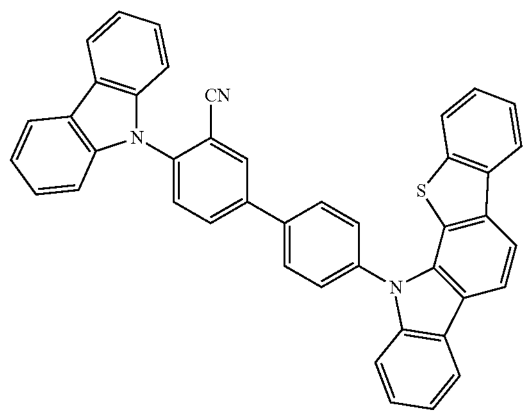
-continued
50
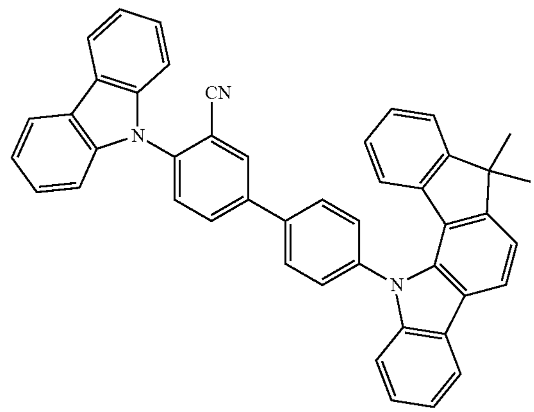
51
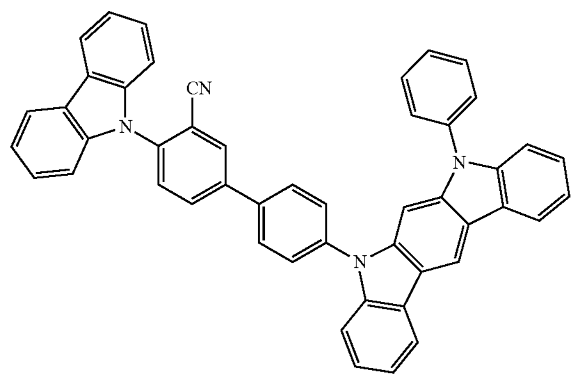
52
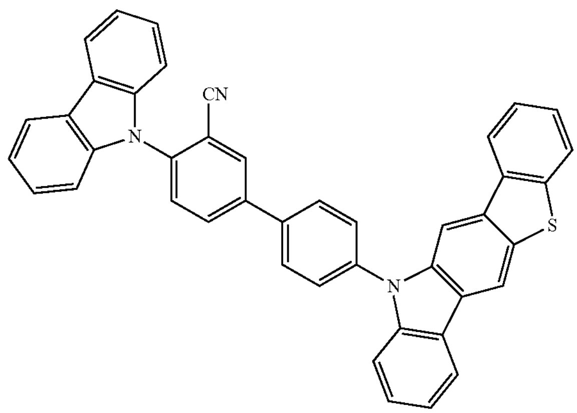
53
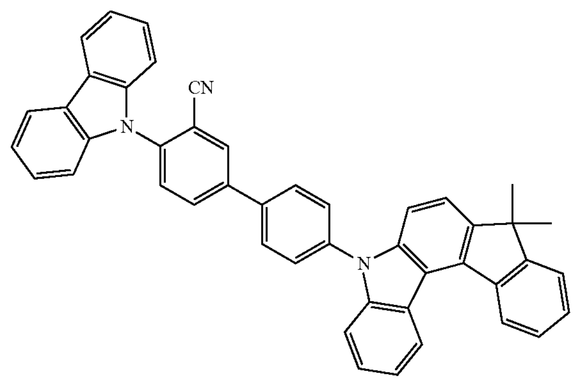

-continued
54
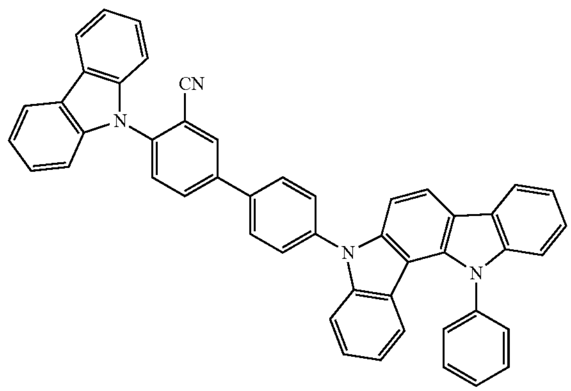
55
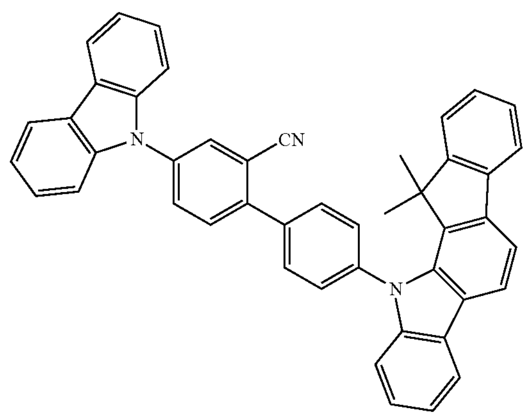
56
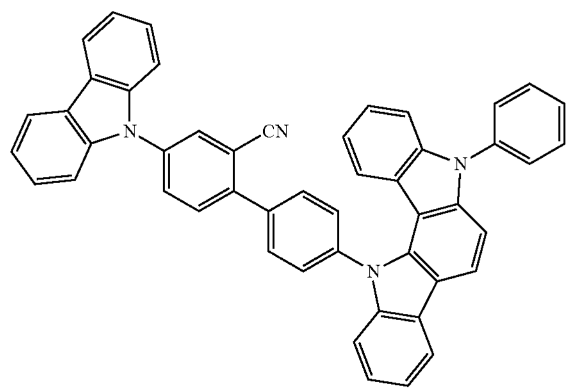
57
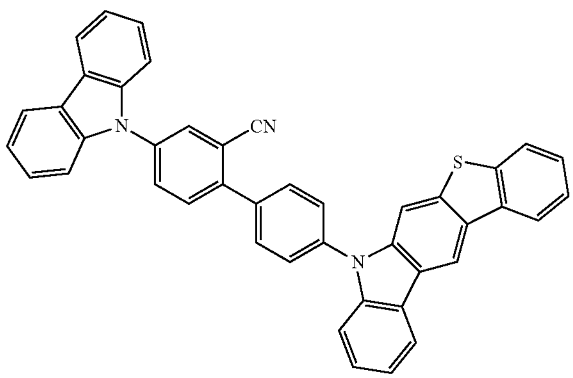
-continued
58
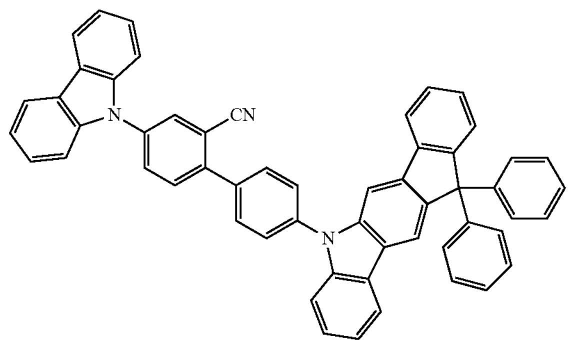
59
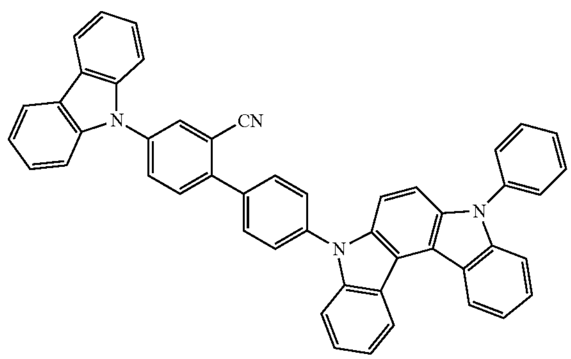
60
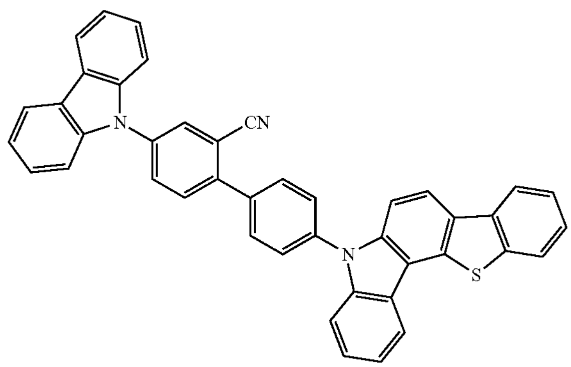
61
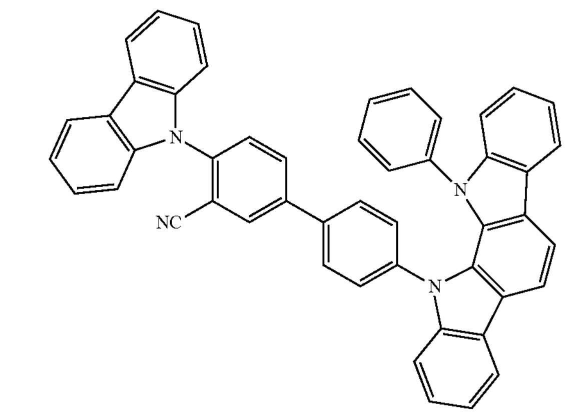

-continued
62
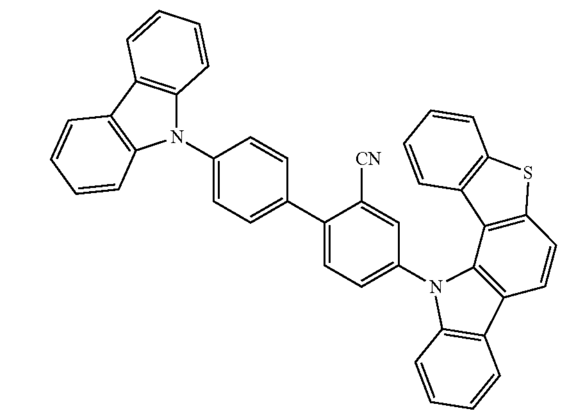
63
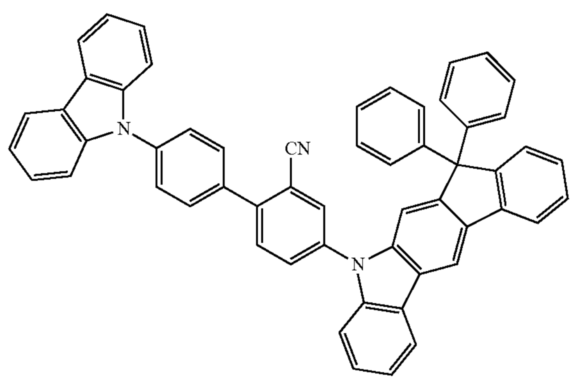
64
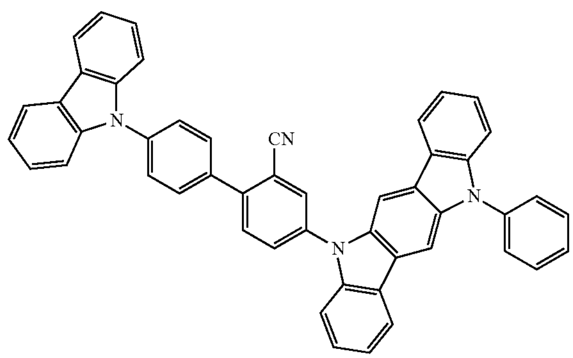
65
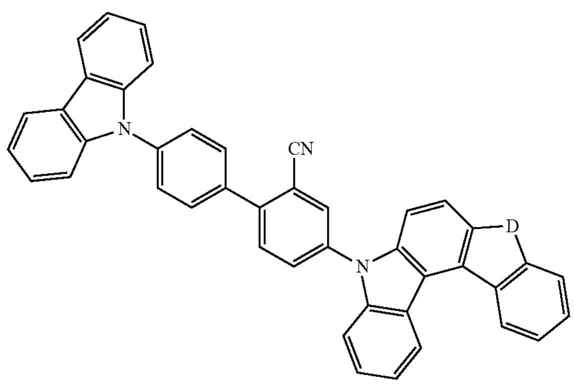
-continued
66
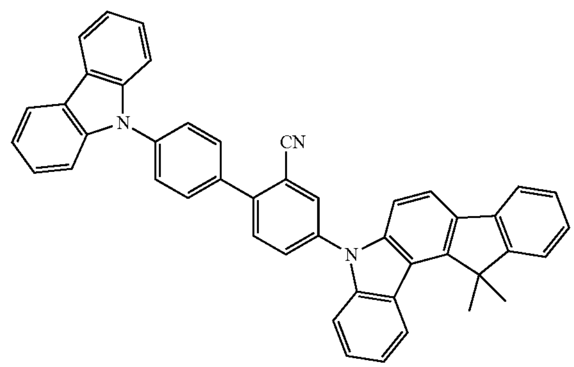
67
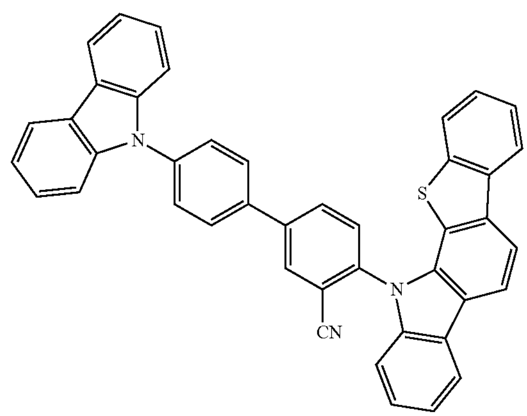
68
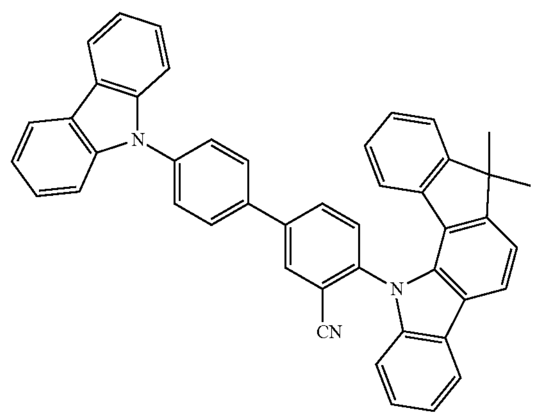
69
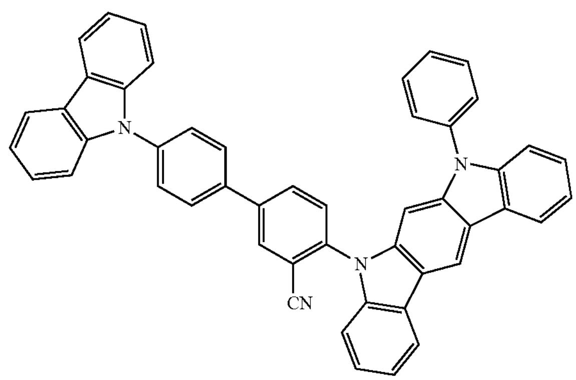

-continued
70
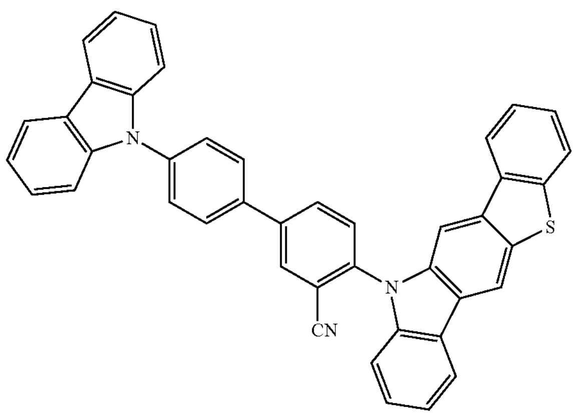
71
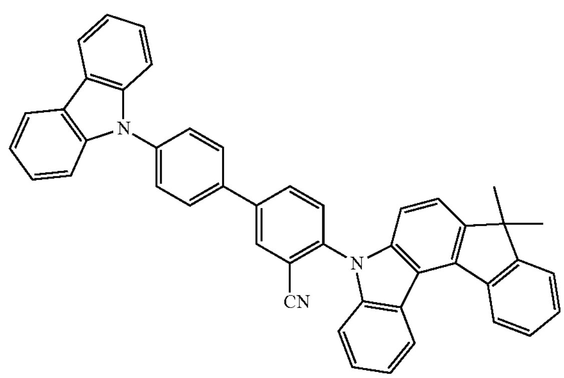
72
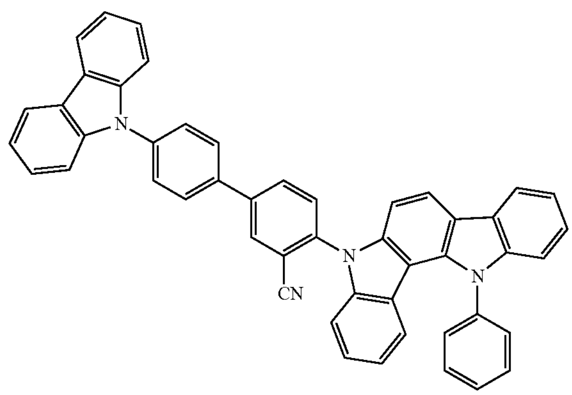
-continued
73
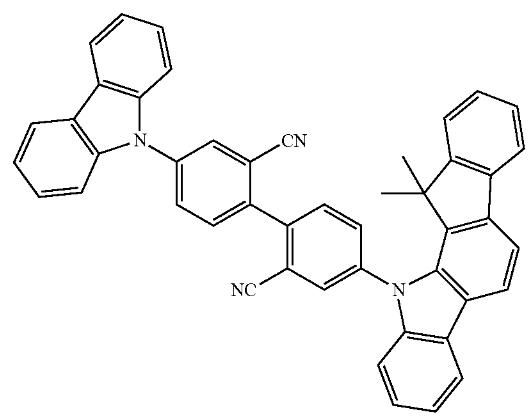
74
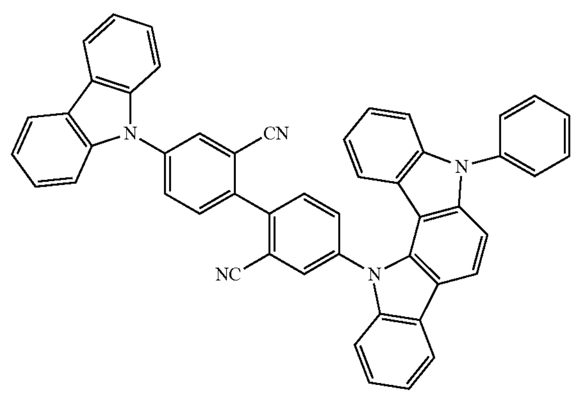
75
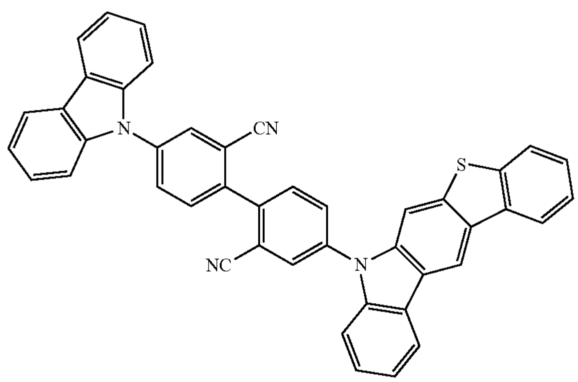
76
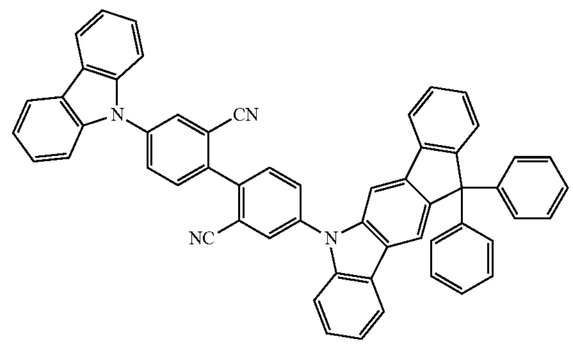

77
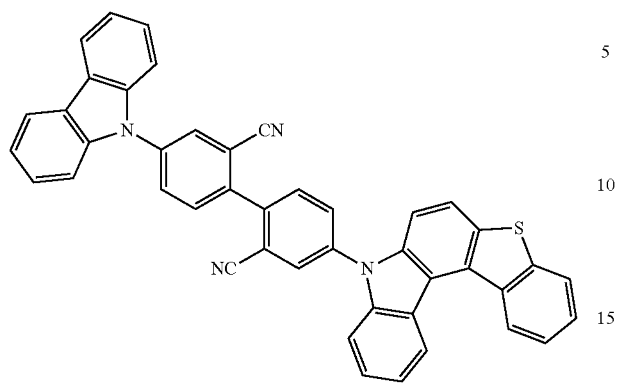
78
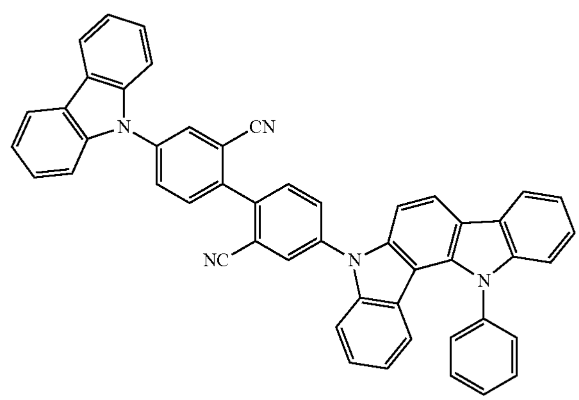
79
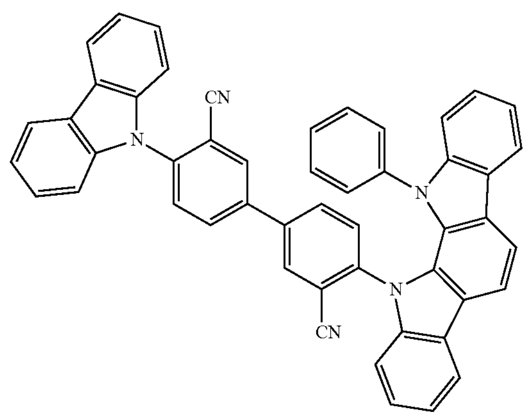
80
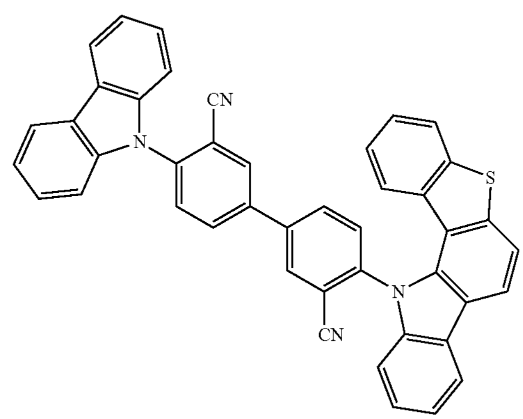
81
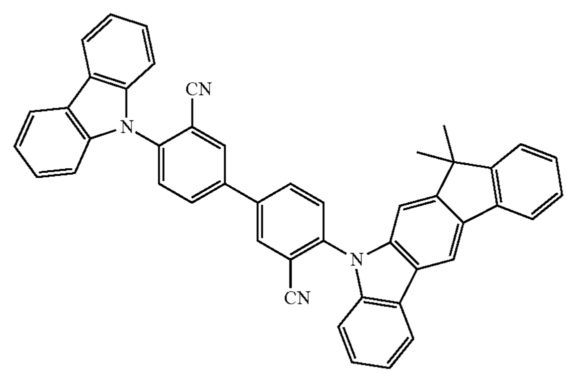
82
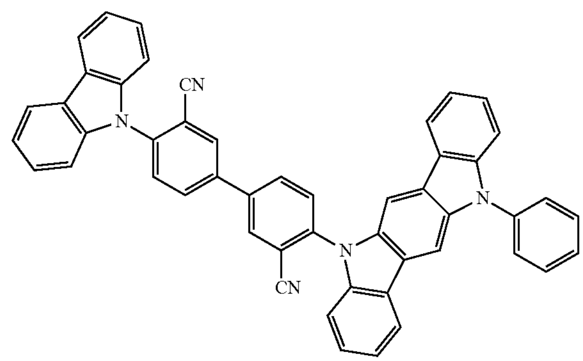
83
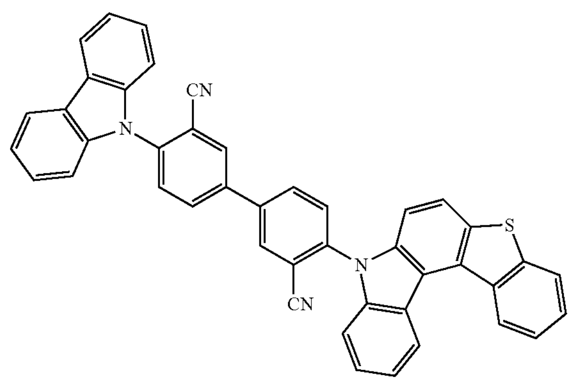

-continued
84
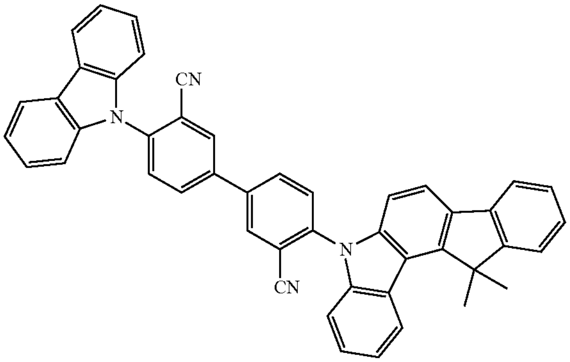
85
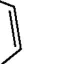
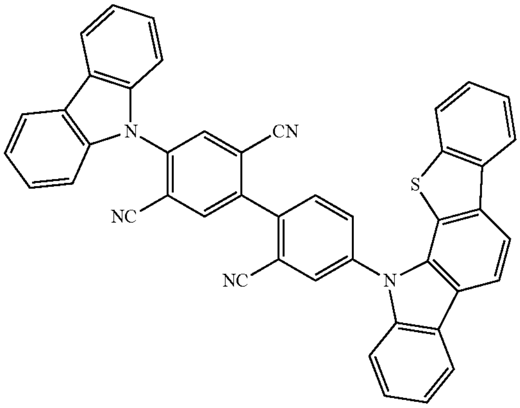
86
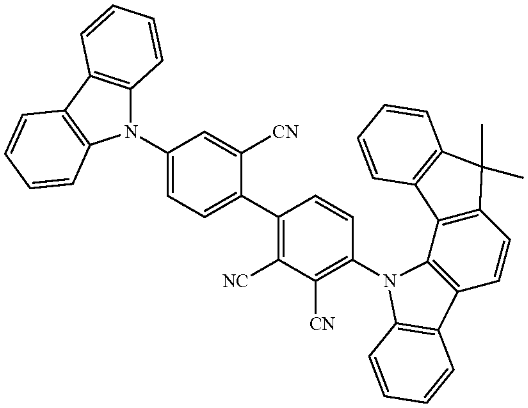
87
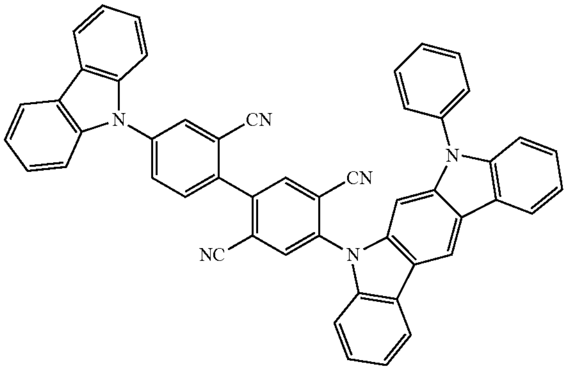
-continued
88
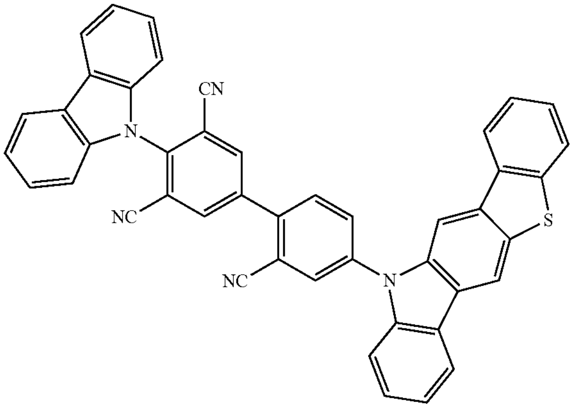
89
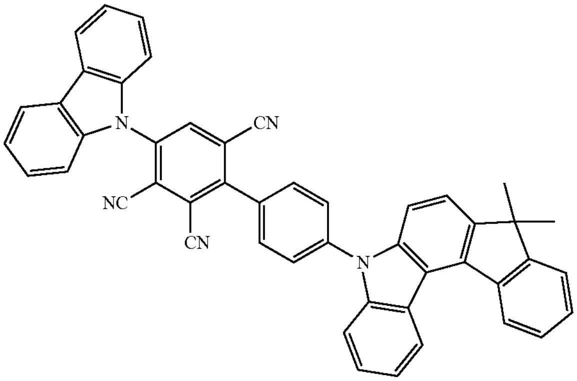
90
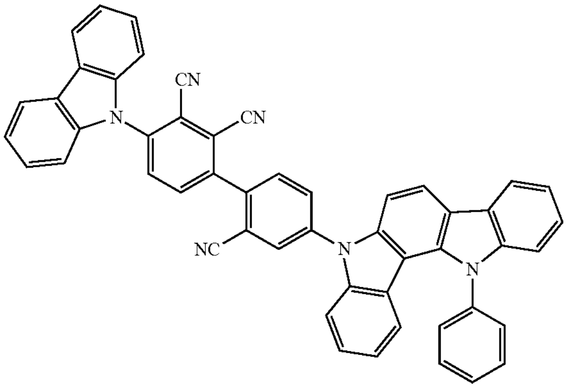

91
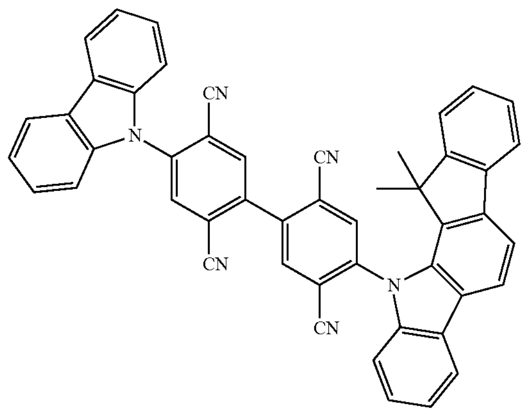
92
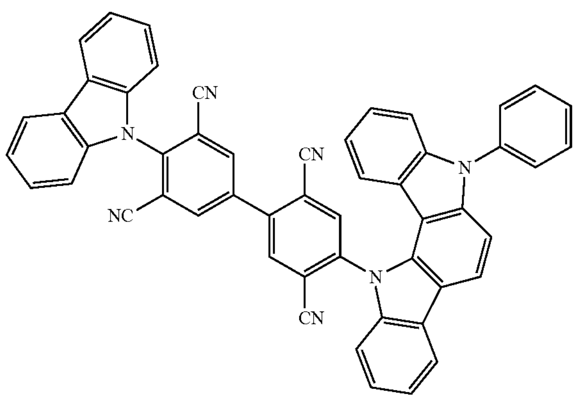
93
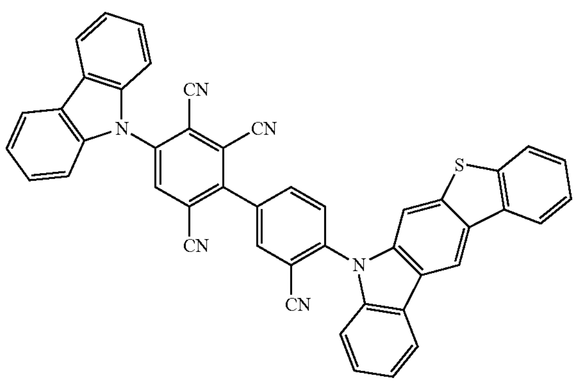
94
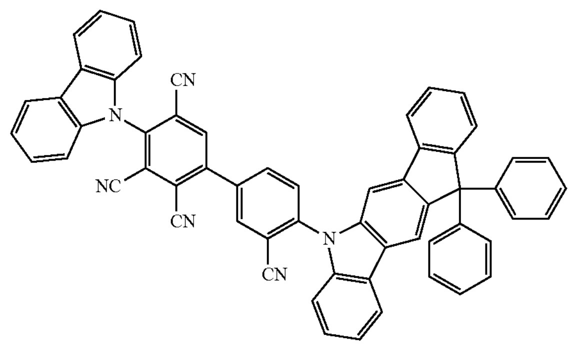
95
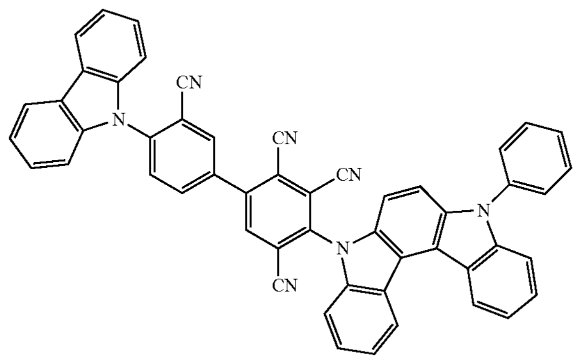
96
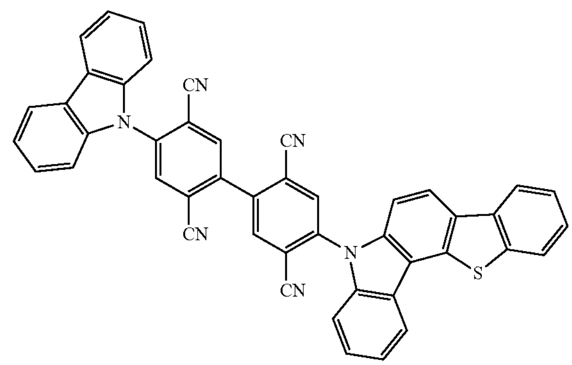
97
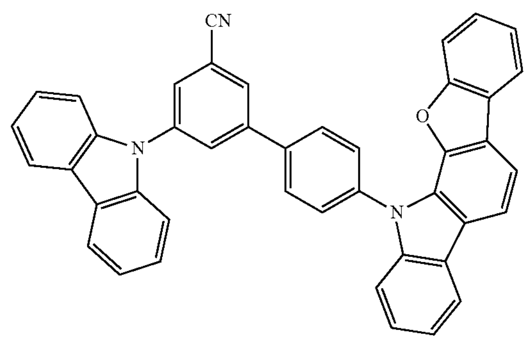
98
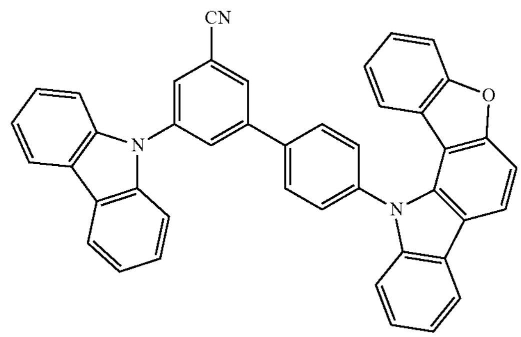

-continued
99
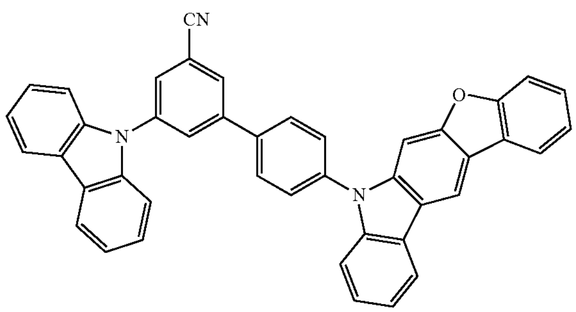
100
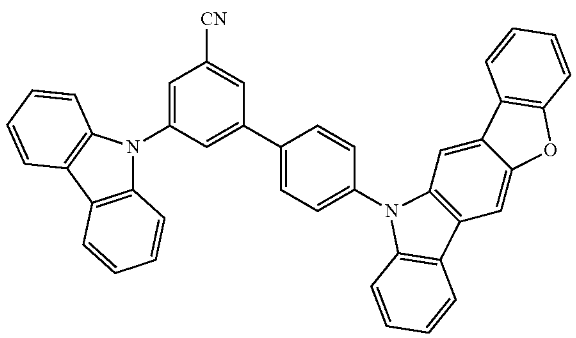
101
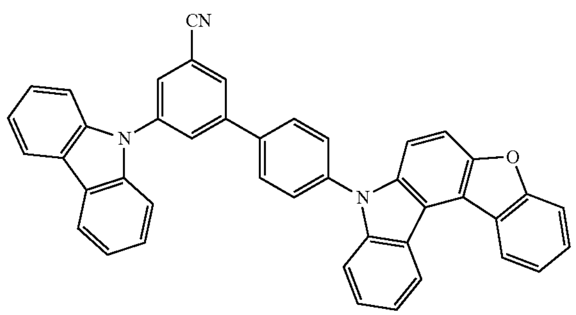
102
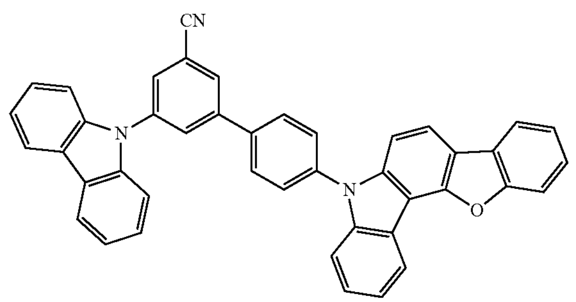
-continued
103
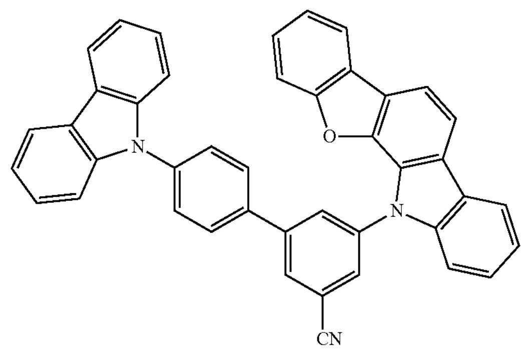
104
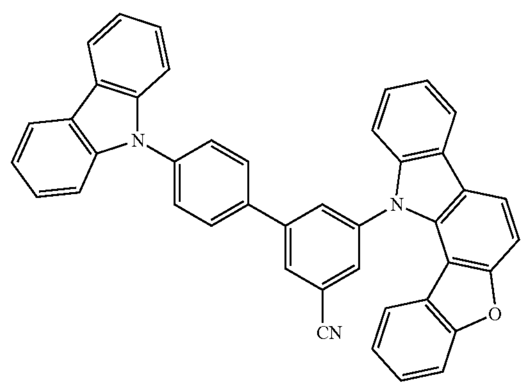
105
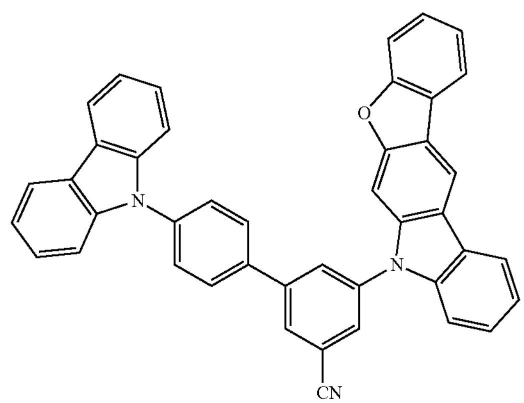
106
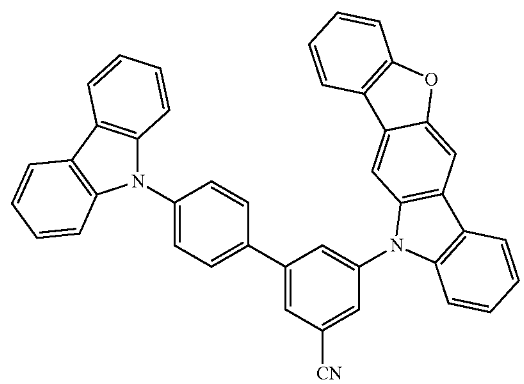

-continued
107
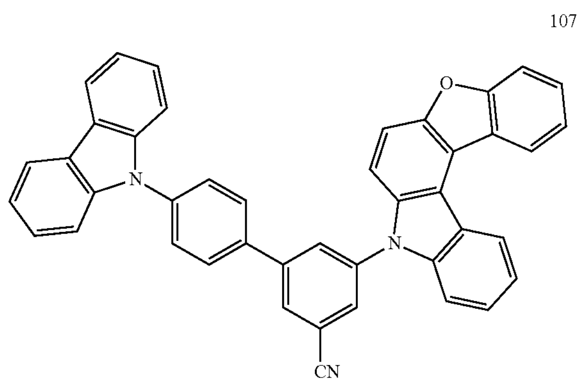
108
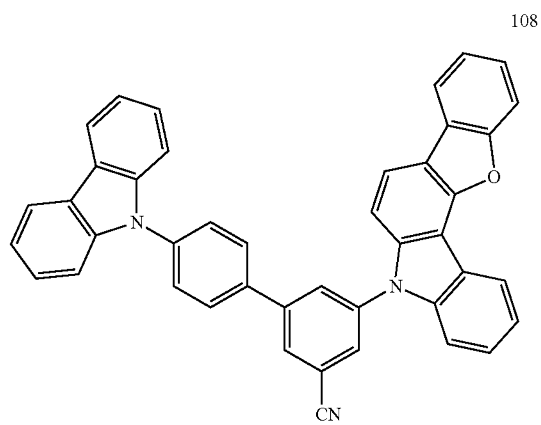
109
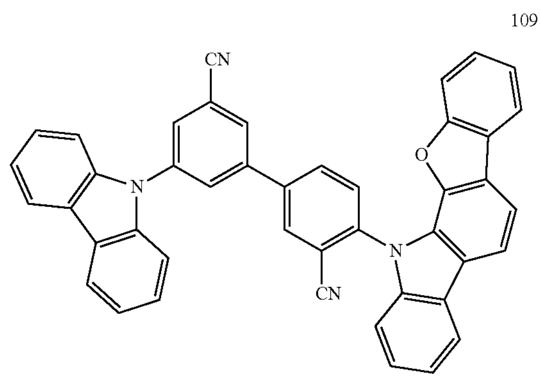
110
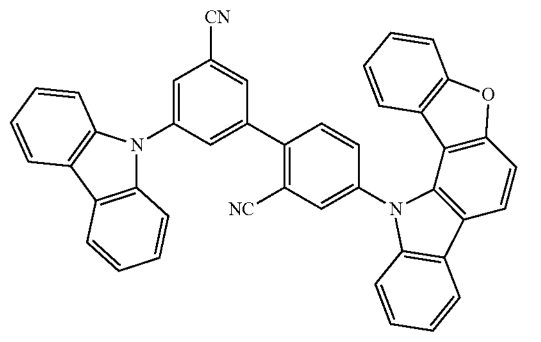
-continued
111
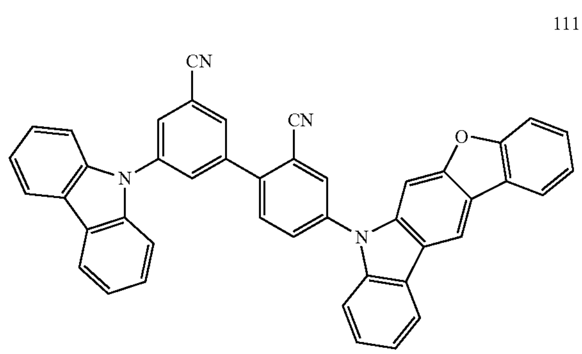
112
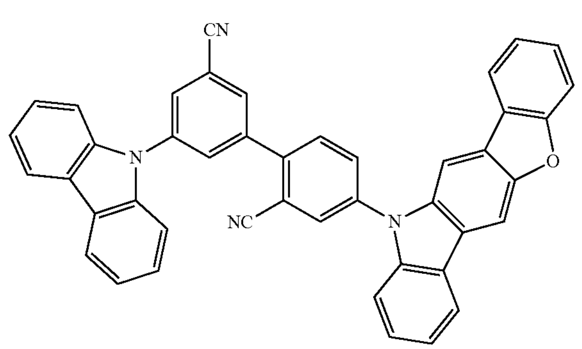
113
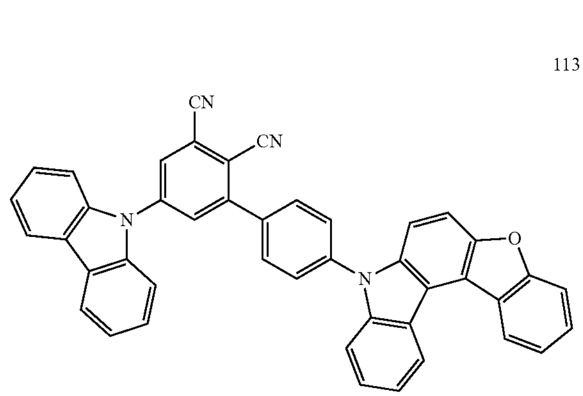
114
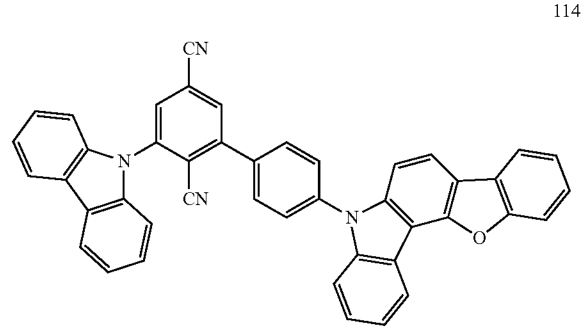

-continued
115
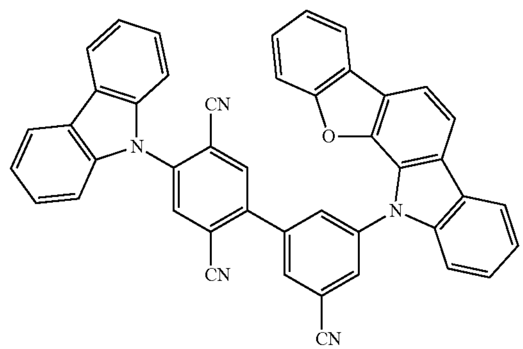
116
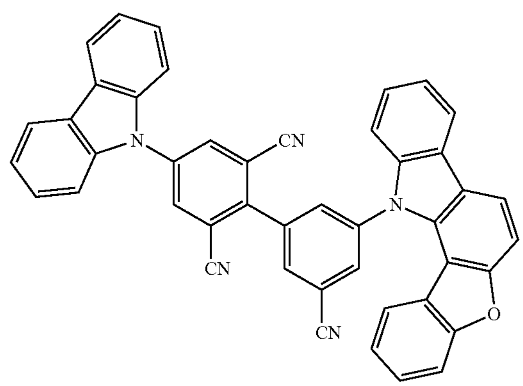
117
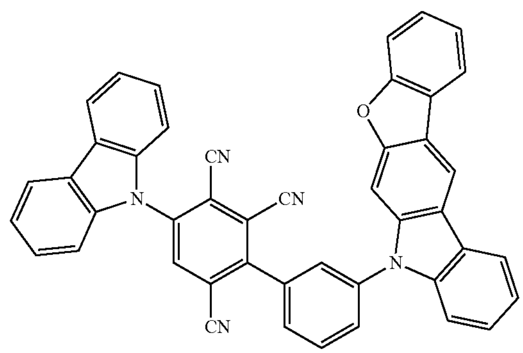
118
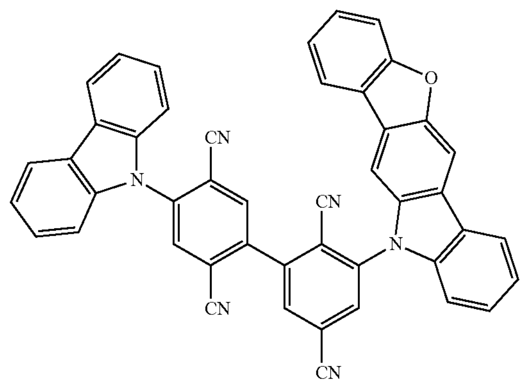
-continued
119
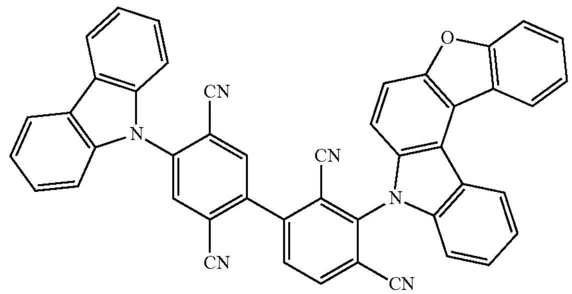
120
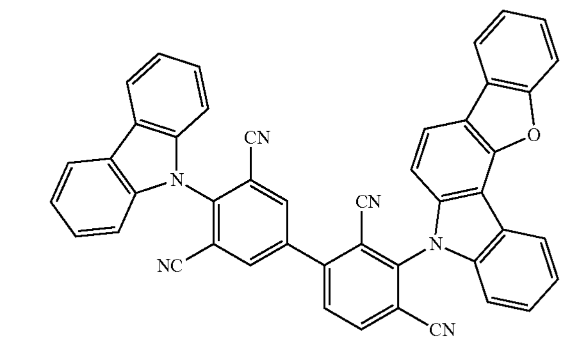
121
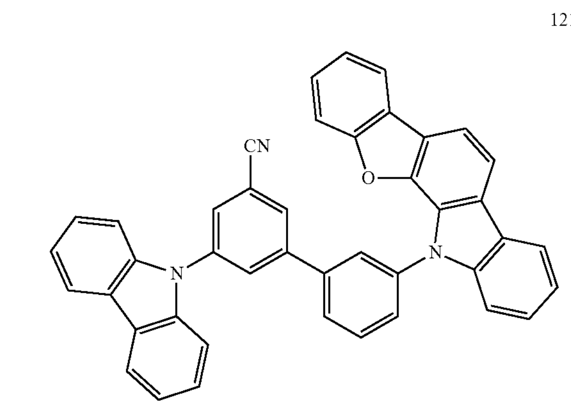
122
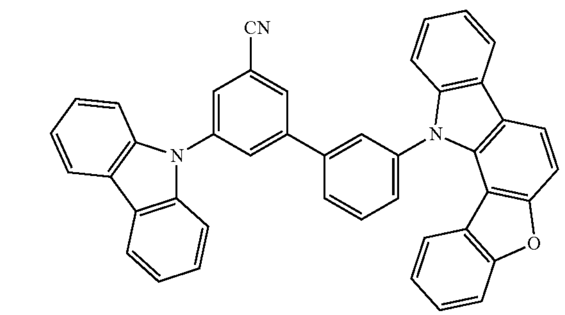

-continued
123
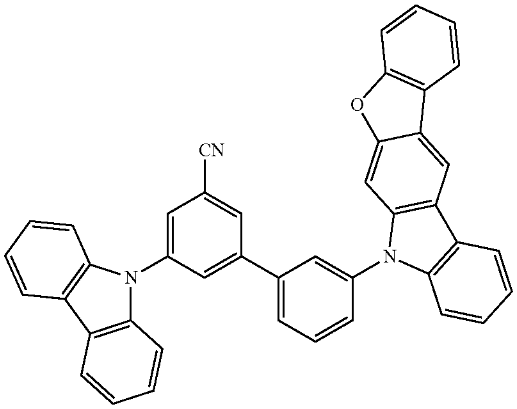
124
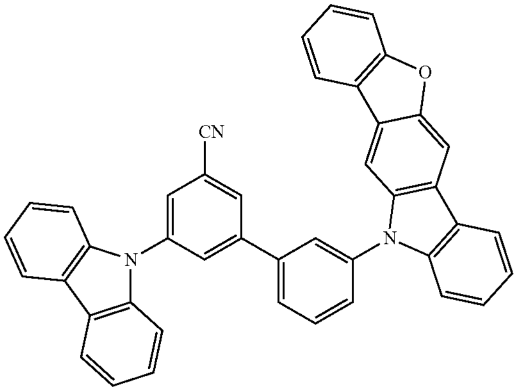
125
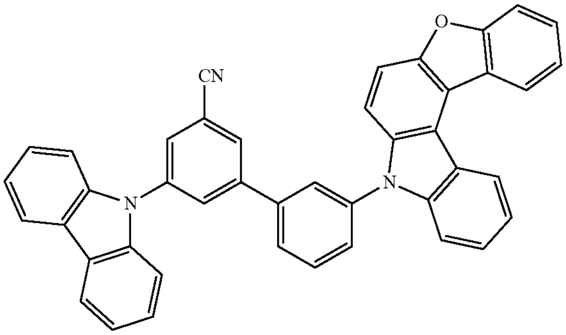
126
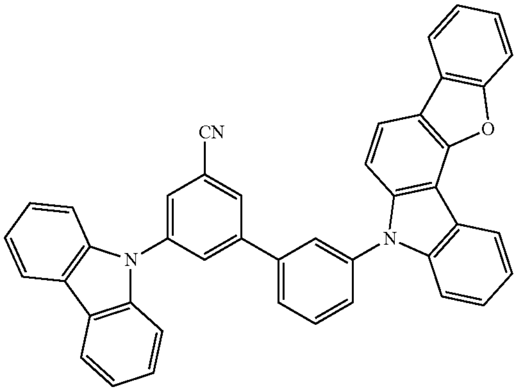
-continued
127
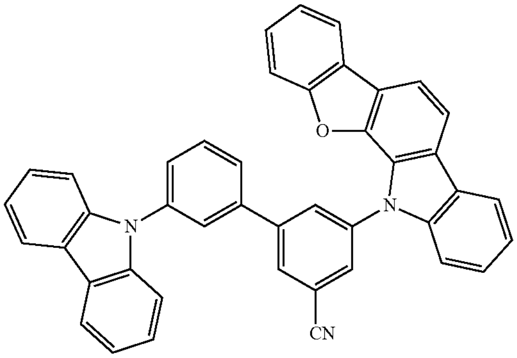
128
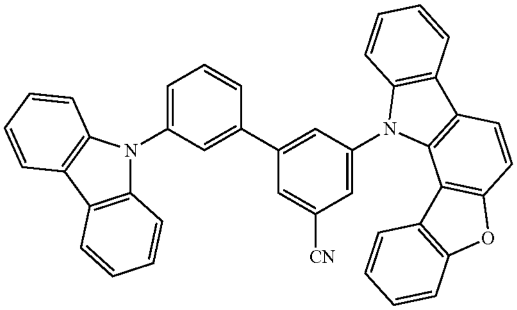
129
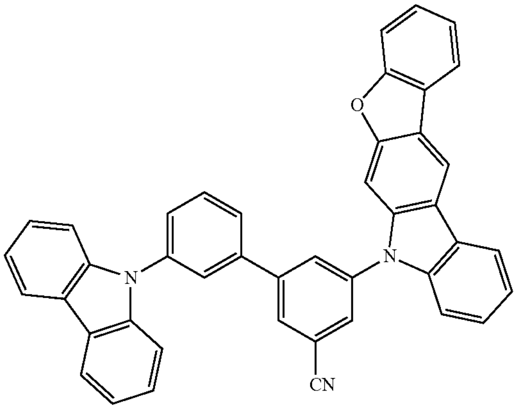
130
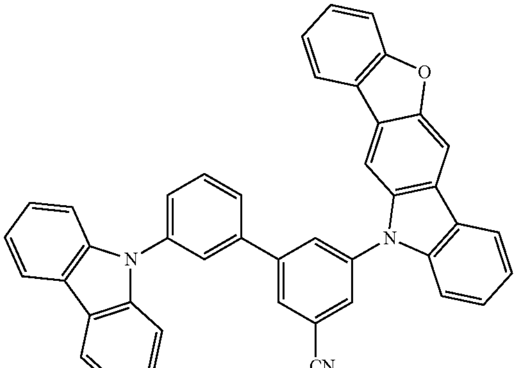

-continued
131
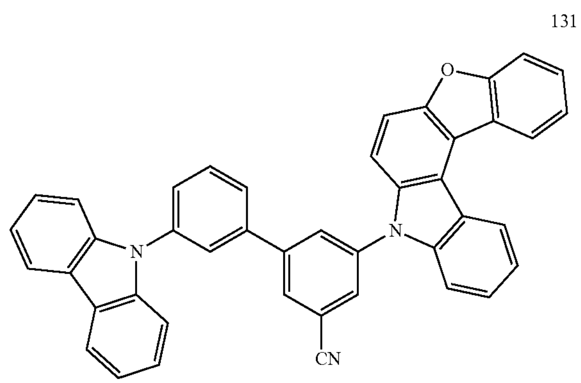
132
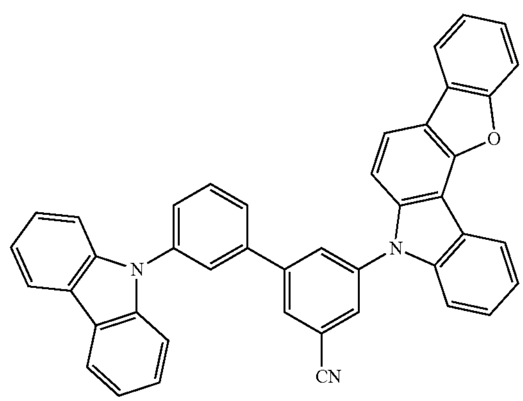
133
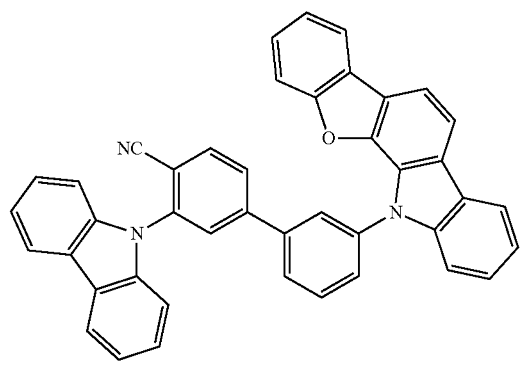
134
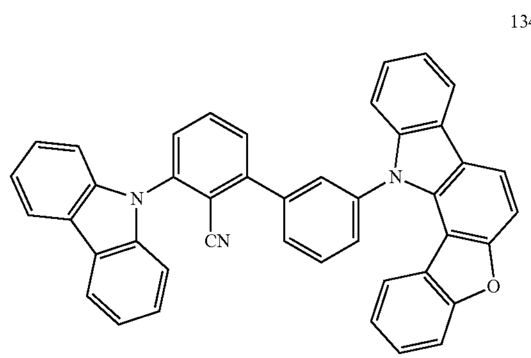
-continued
135
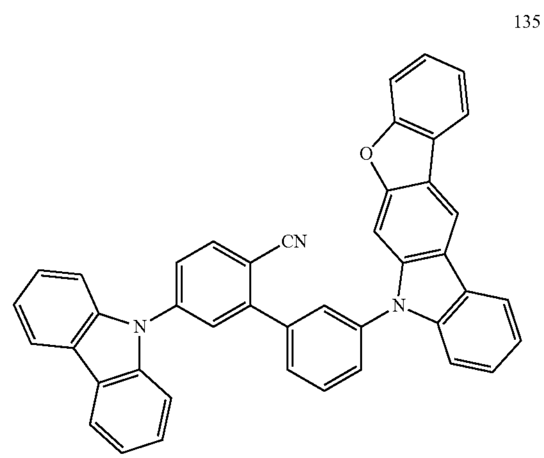
136
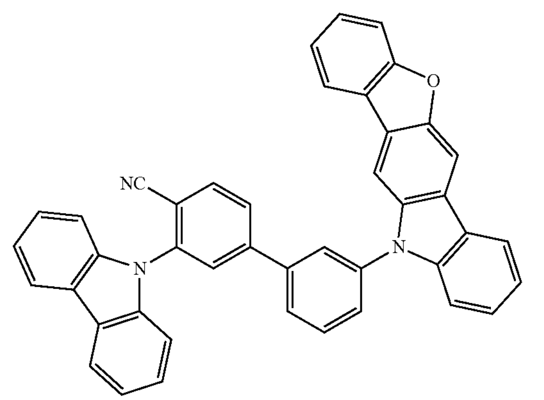
137
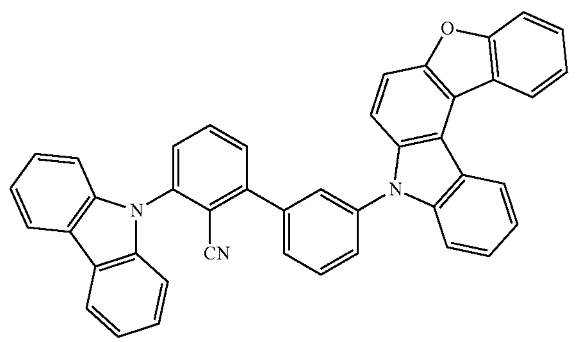
138
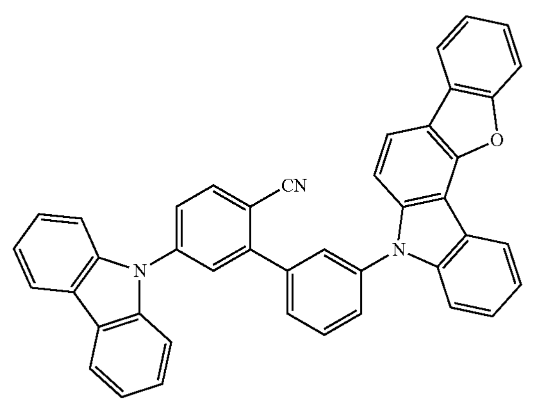

-continued
139
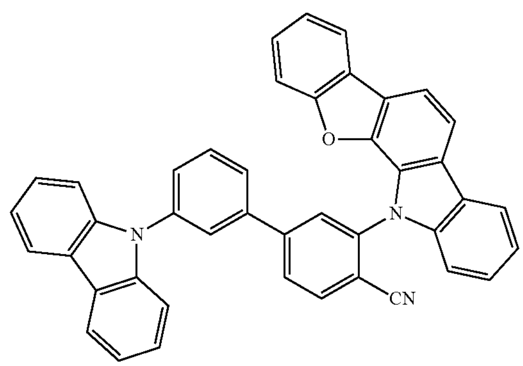
140
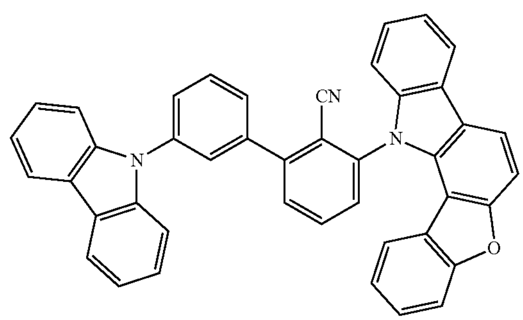
141
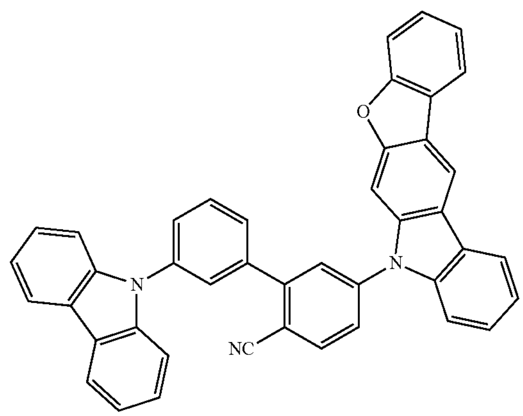
142
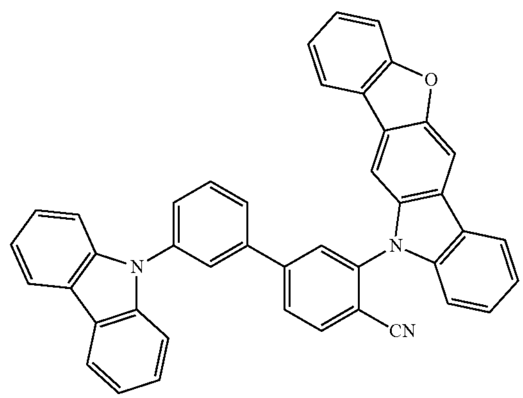
-continued
143
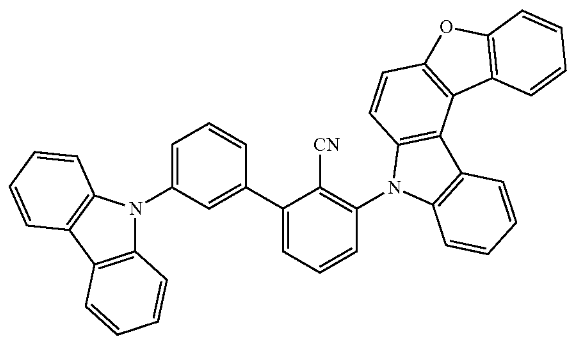
144
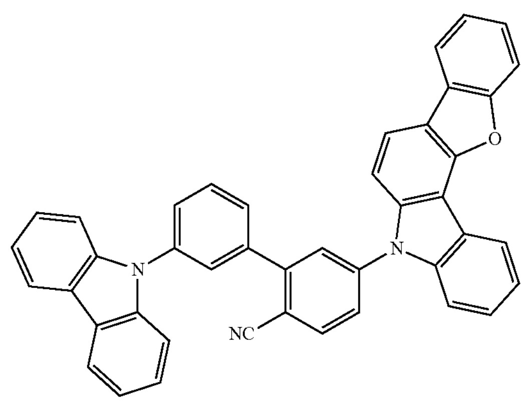
145
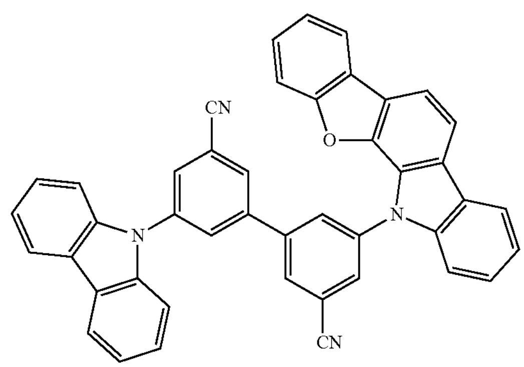
146
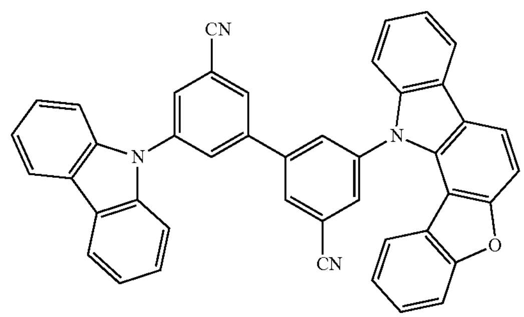

-continued
147
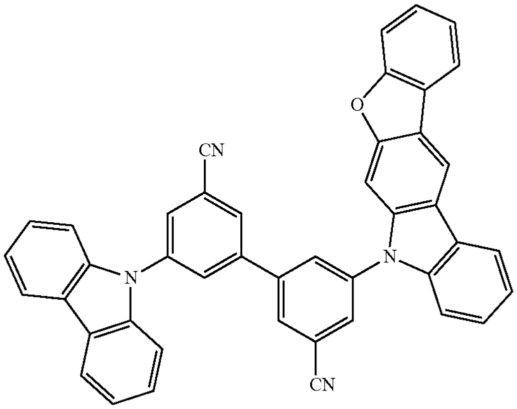
148
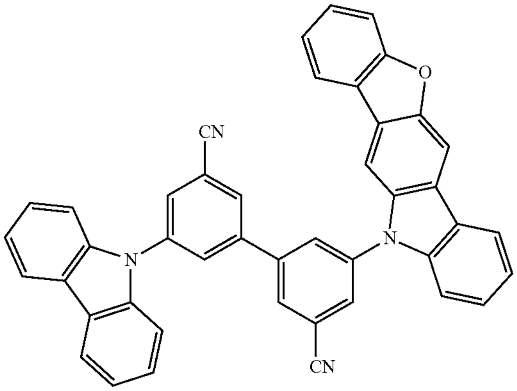
149
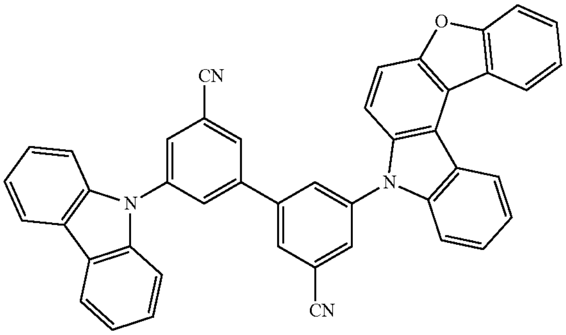
150
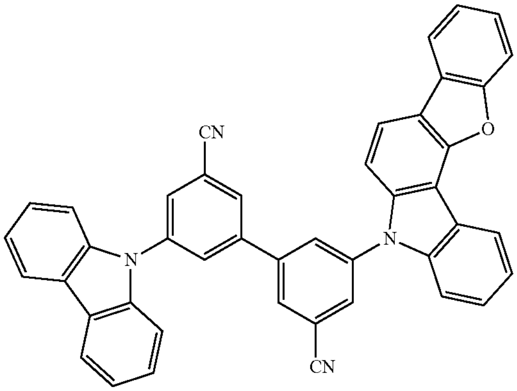
-continued
151
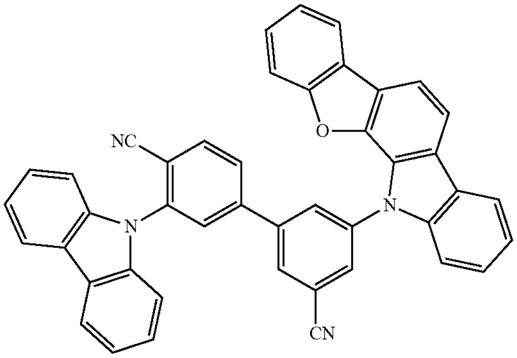
152
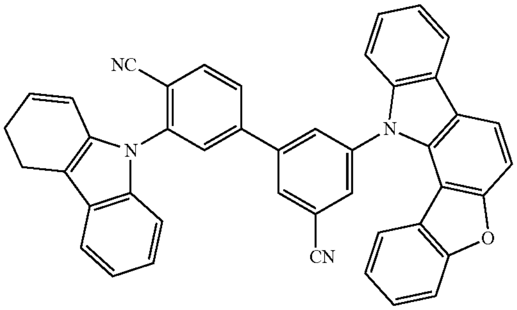
153
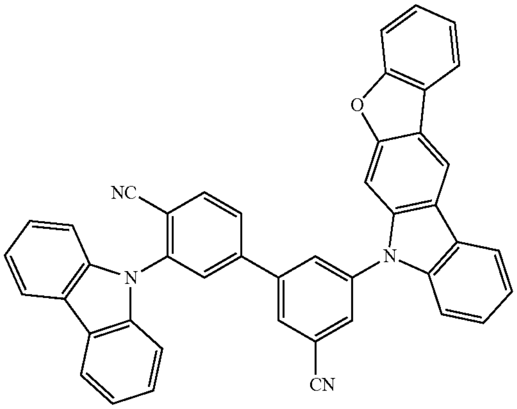
154
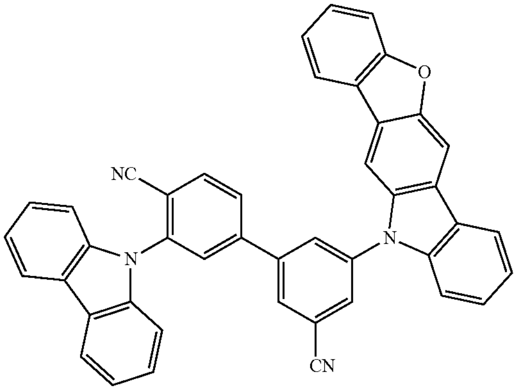

-continued
155
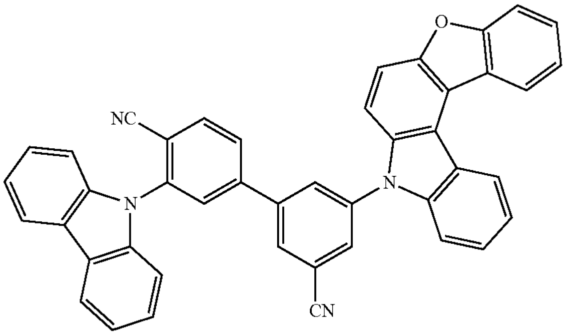
156
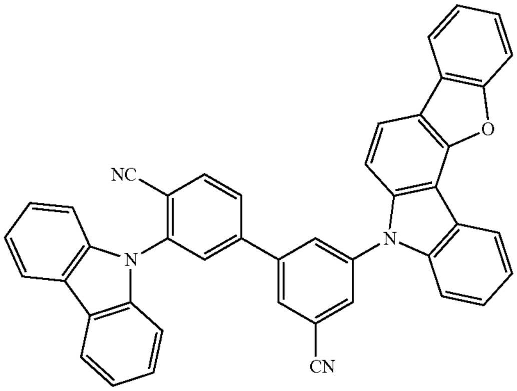
157
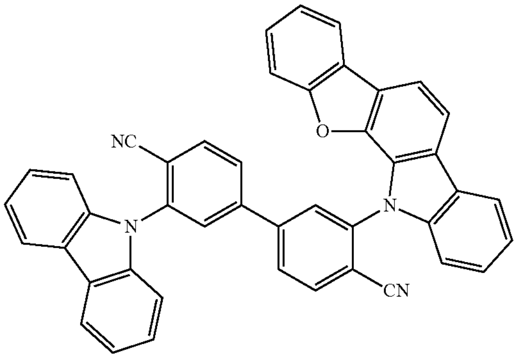
158
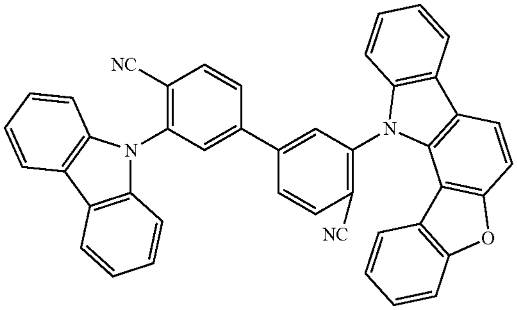
-continued
159
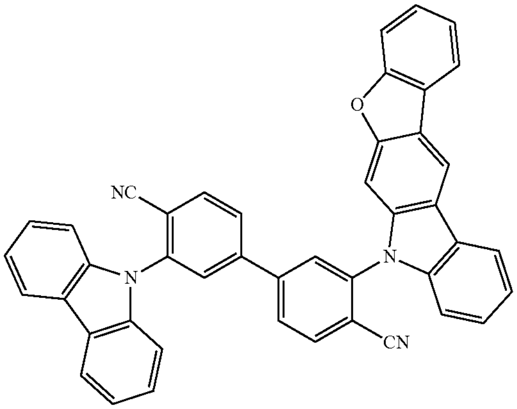
160
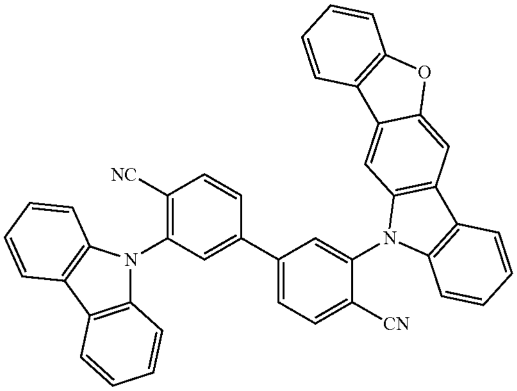
161
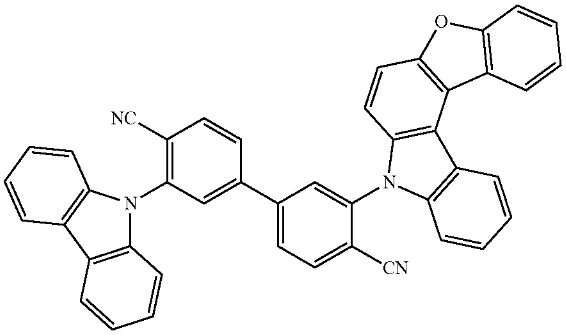
162
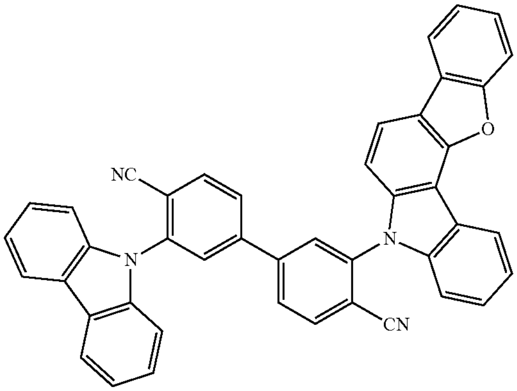

-continued
163
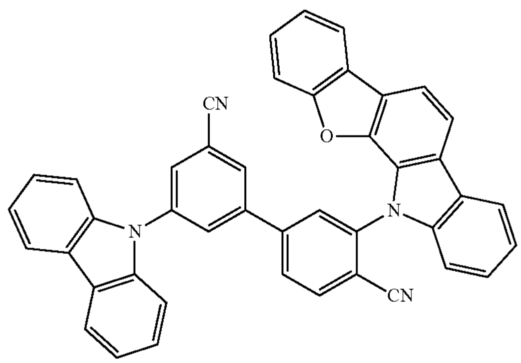
164
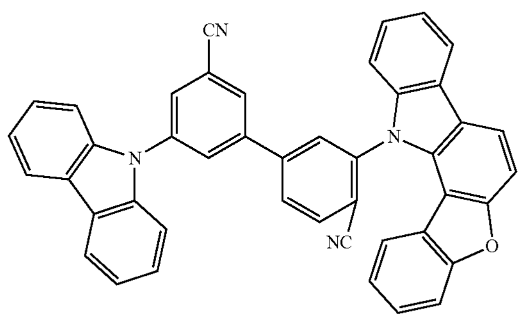
165
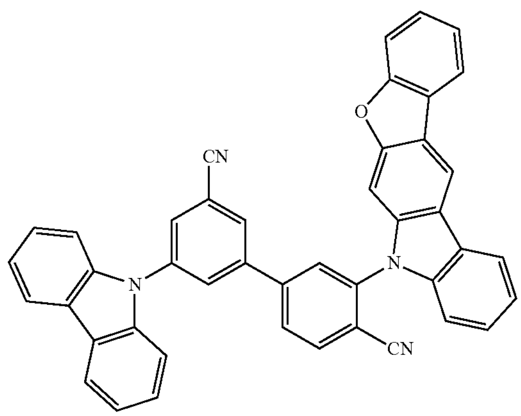
166
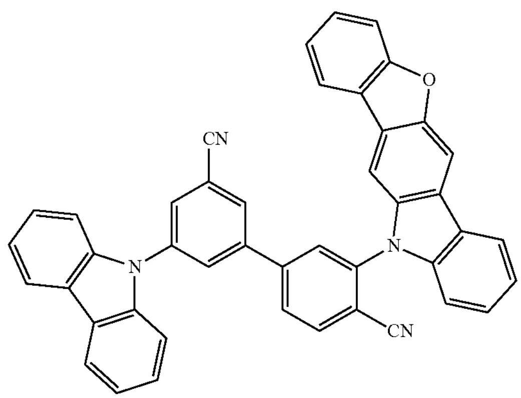
-continued
167
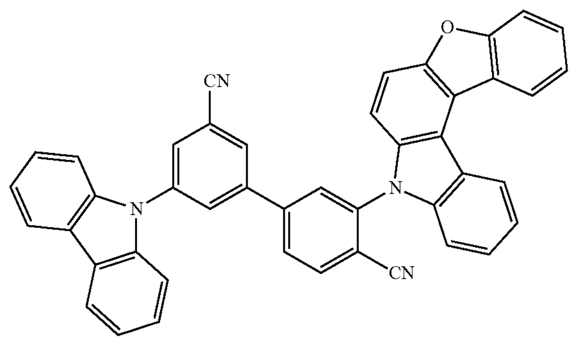
168
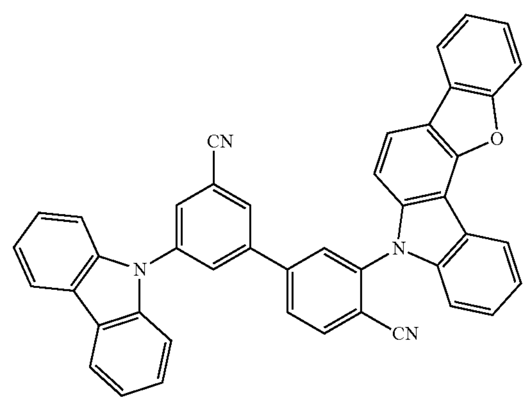
169
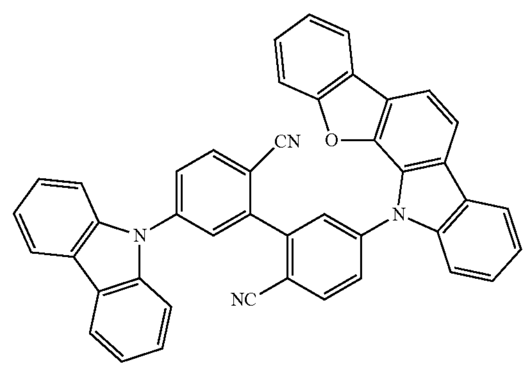
170
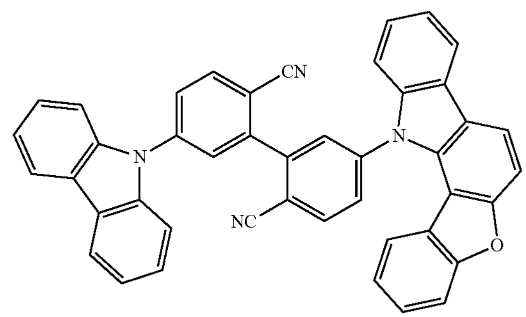

-continued
171
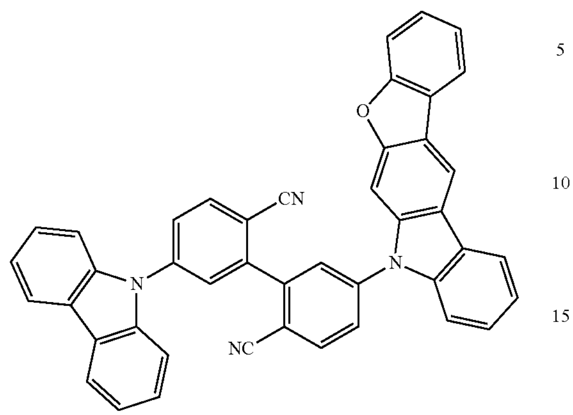
172
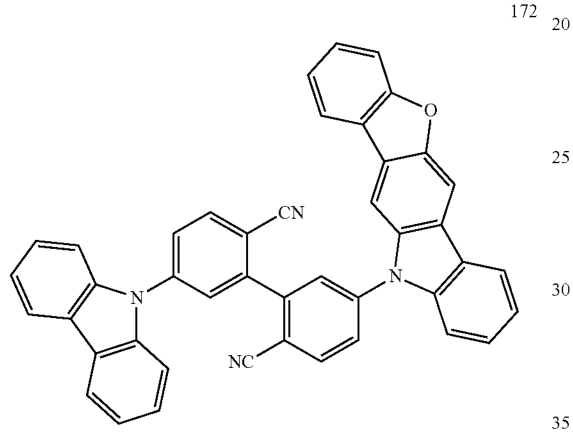
173
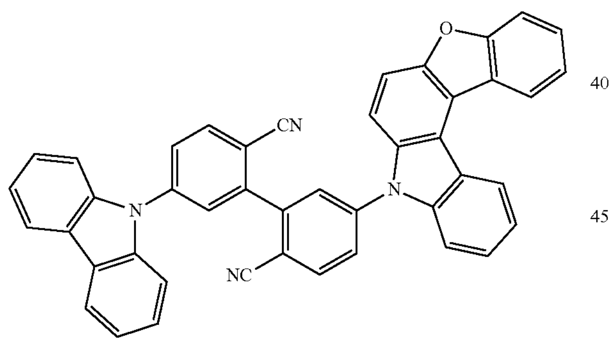
174
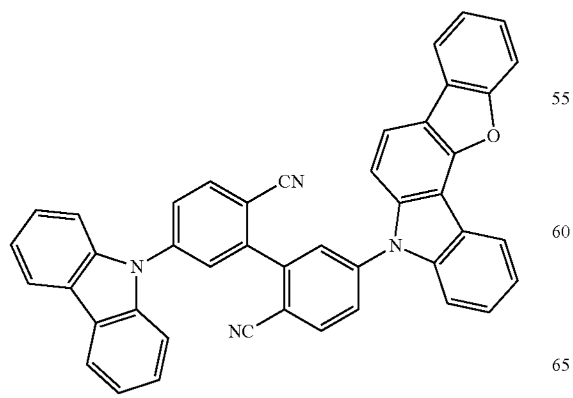
-continued
175
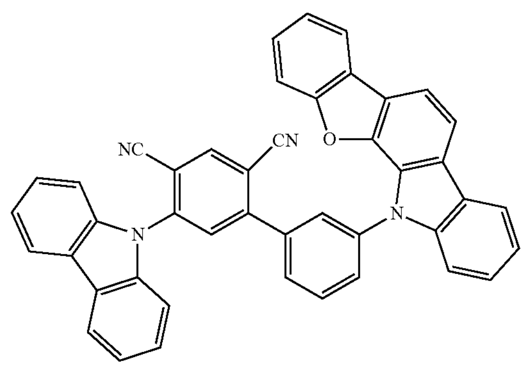
176
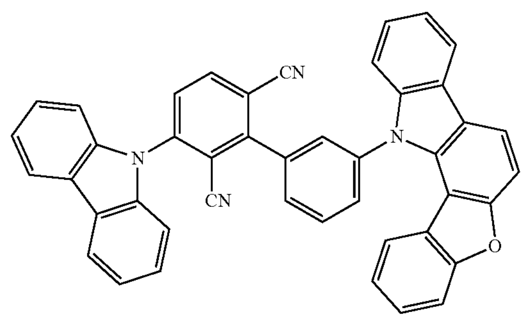
177
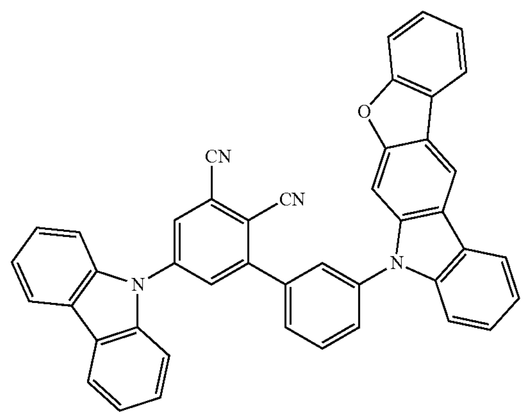
178
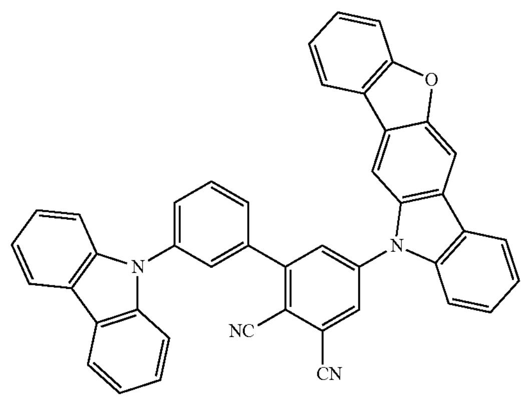

-continued
179
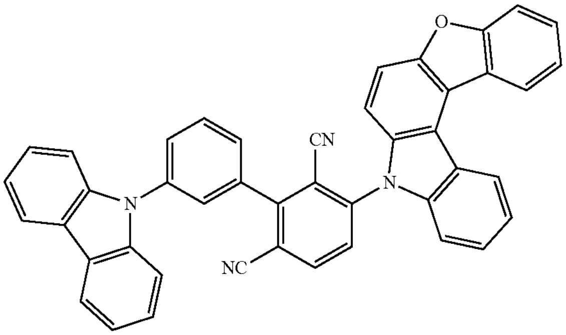
180
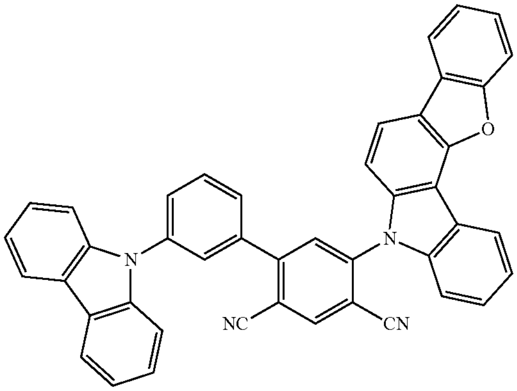
181
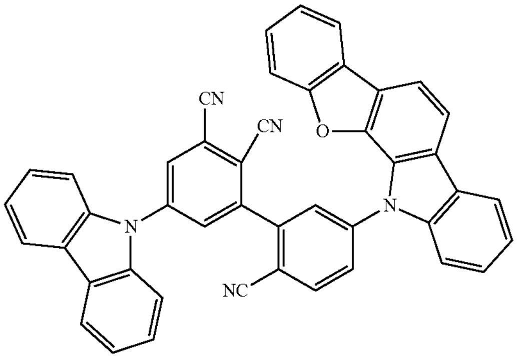
182
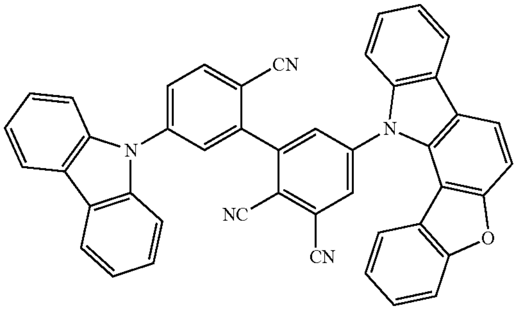
-continued
183
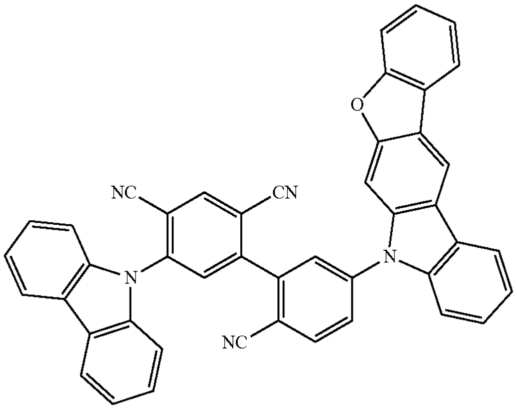
184
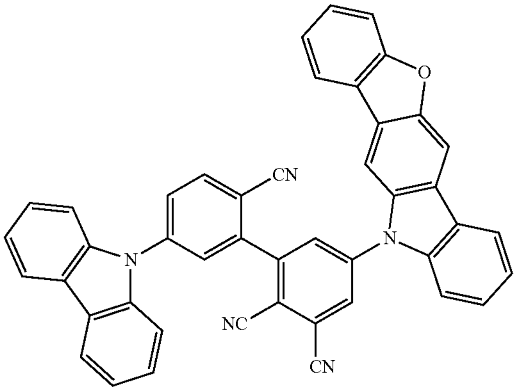
185
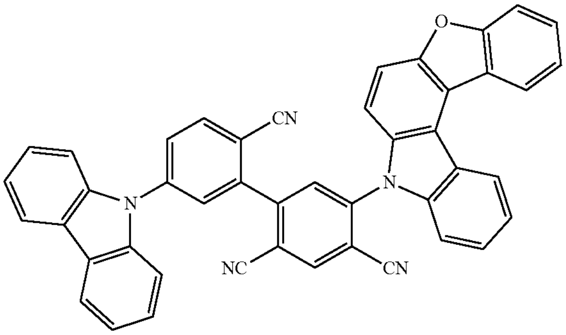
186
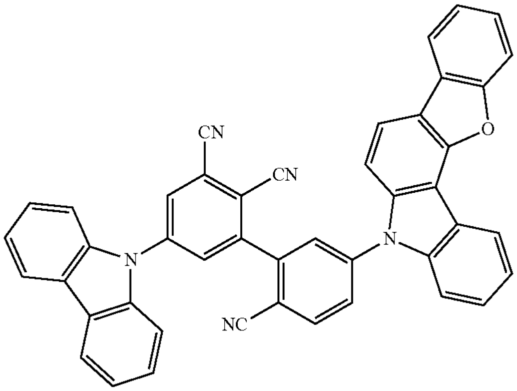

187
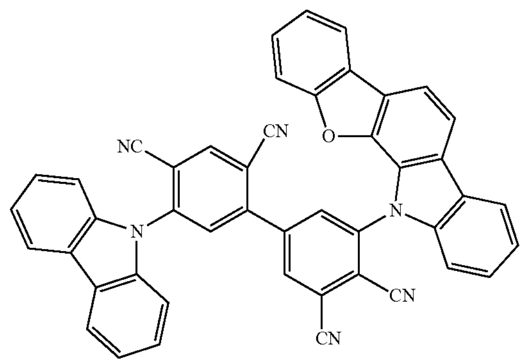
188
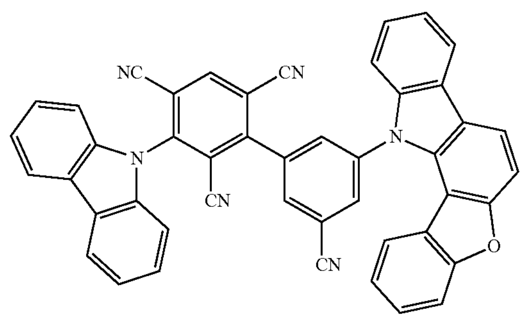
189
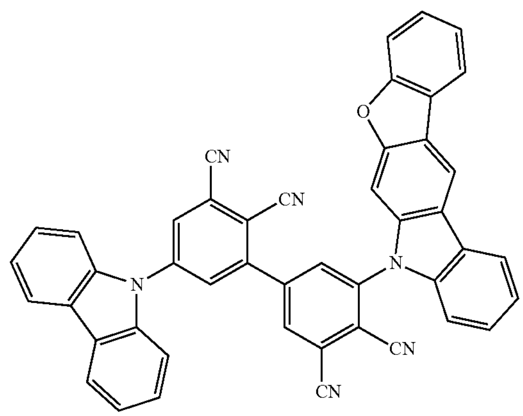
190
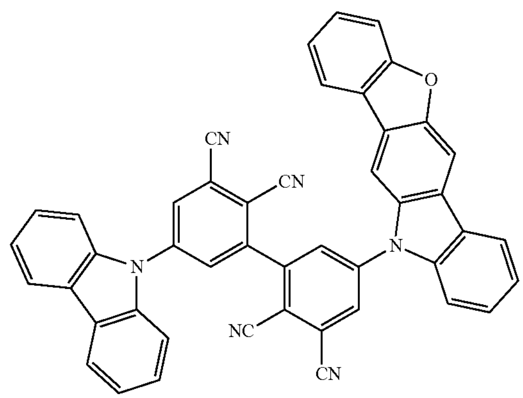
191
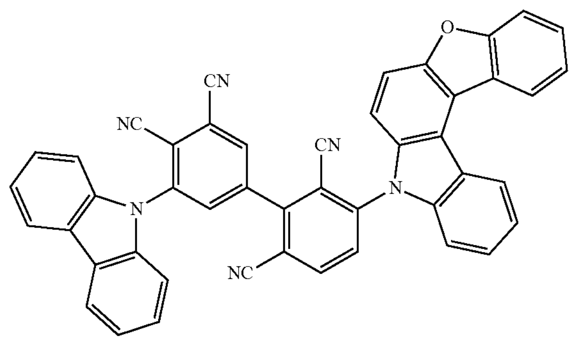
192
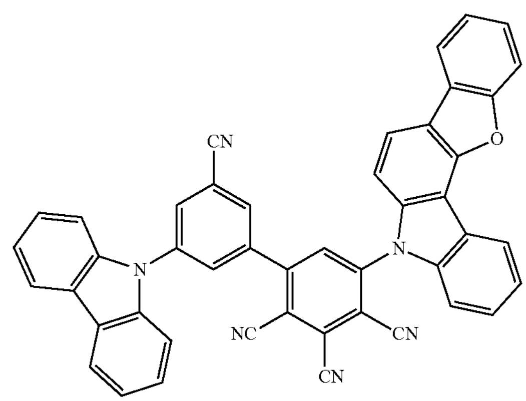
193
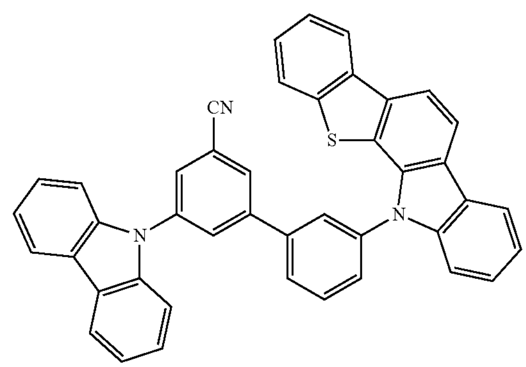
194
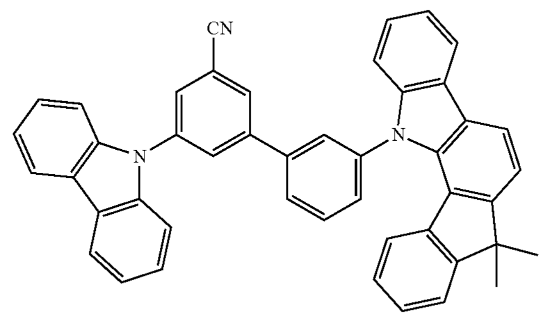

-continued
195
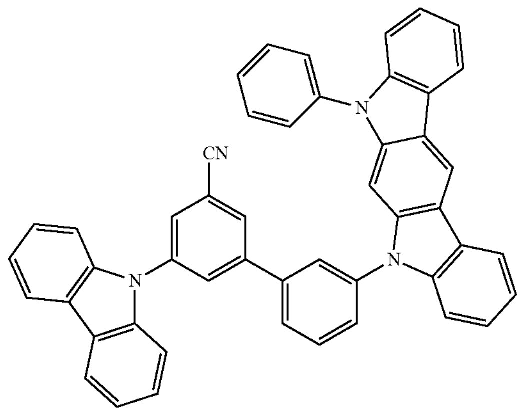
196
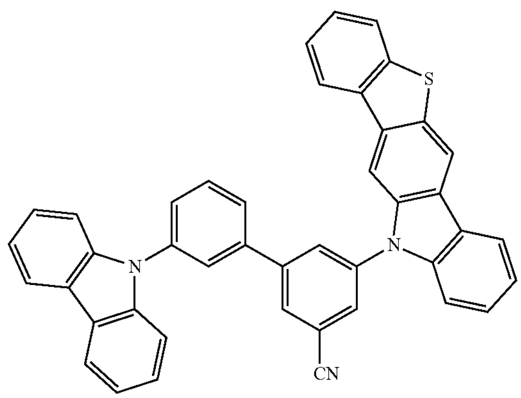
197
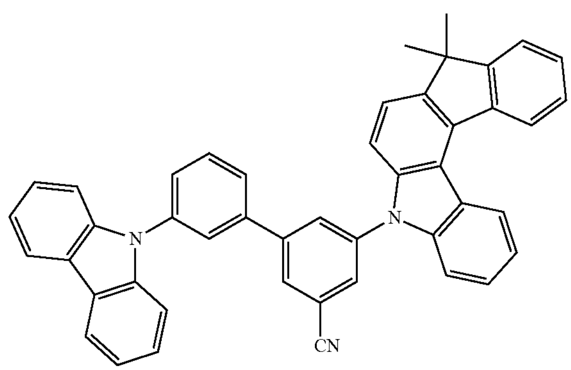
198
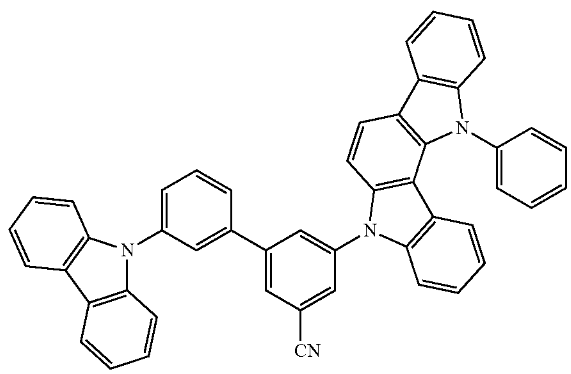
-continued
199
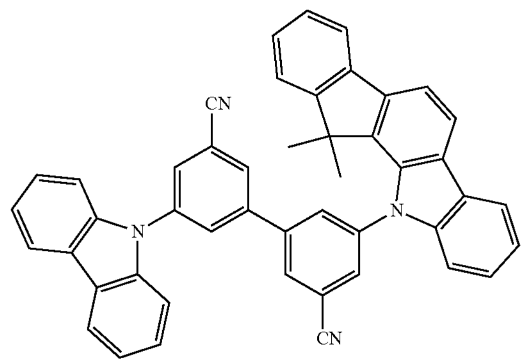
200
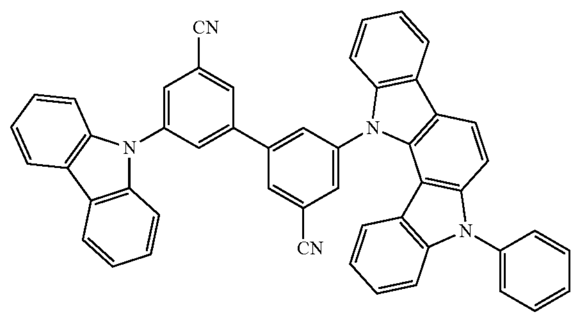
201
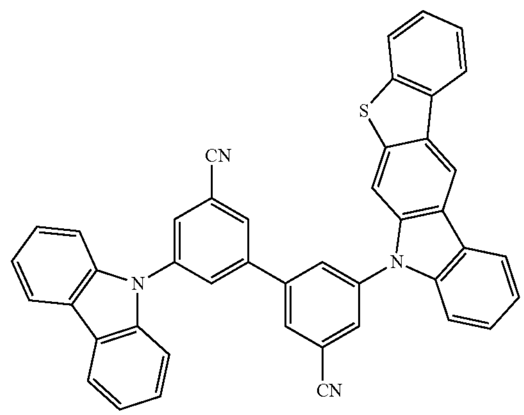
202
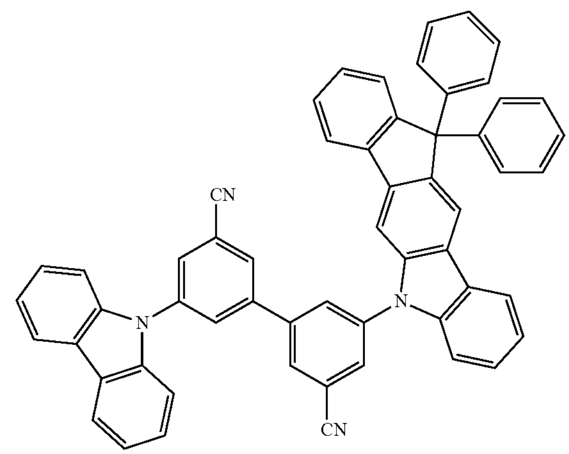

-continued
203
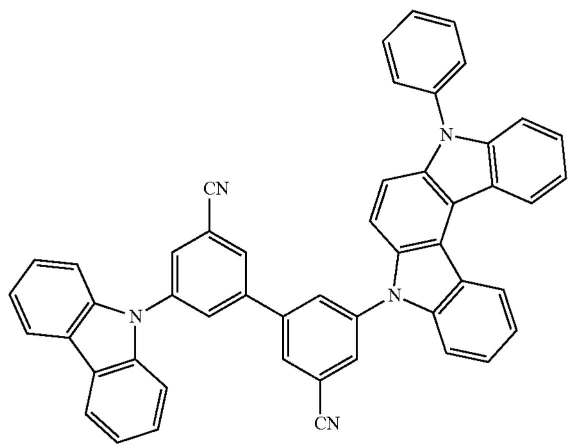
204
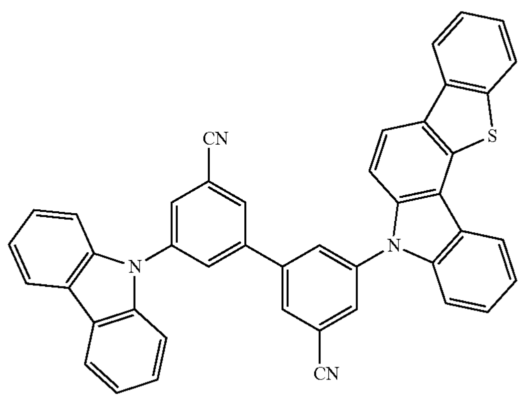
205
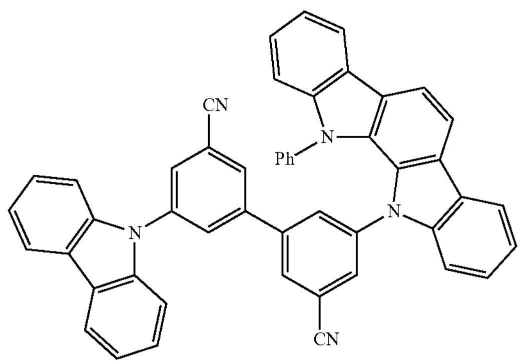
206
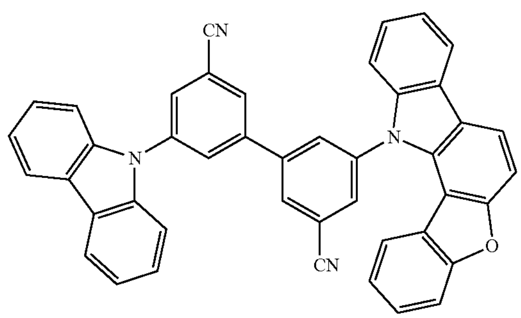
-continued
207
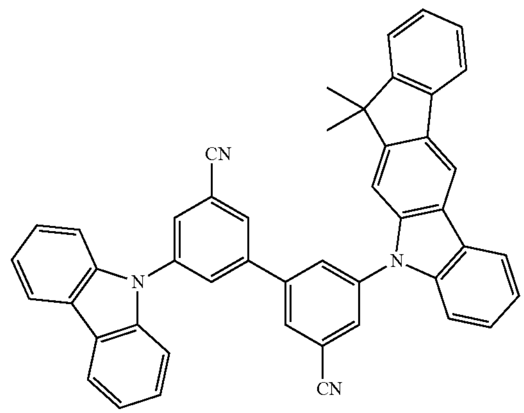
208
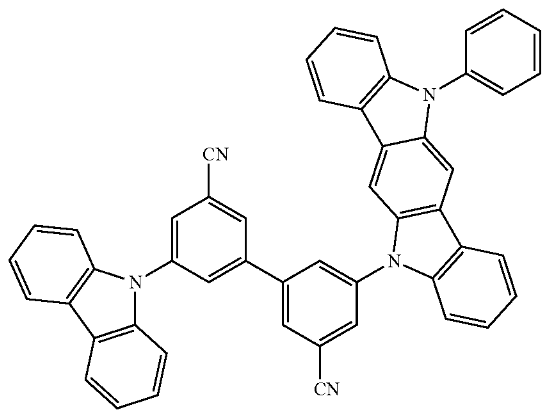
209
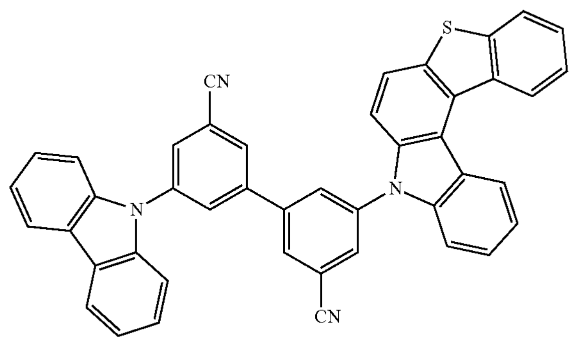
210
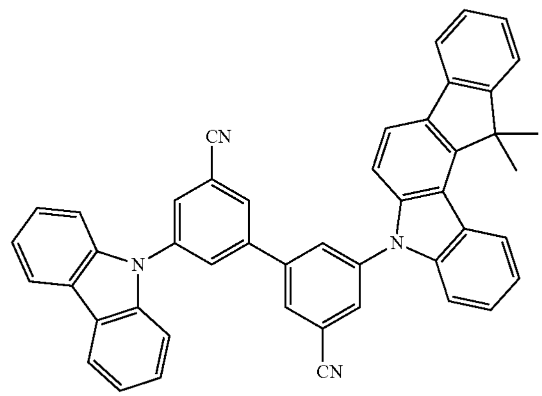

211
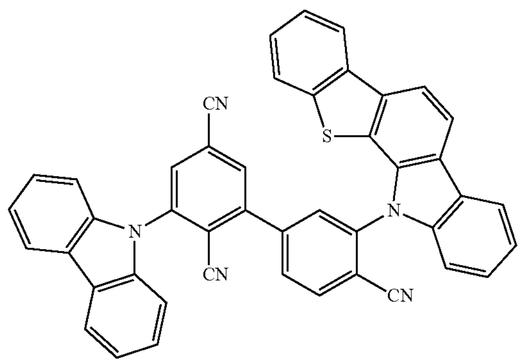
212
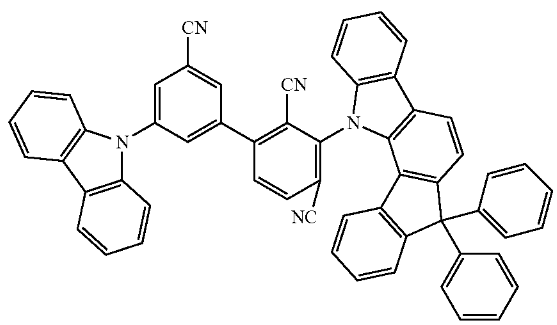
213
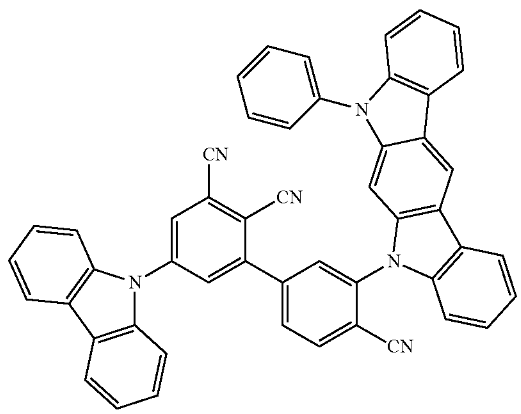
214
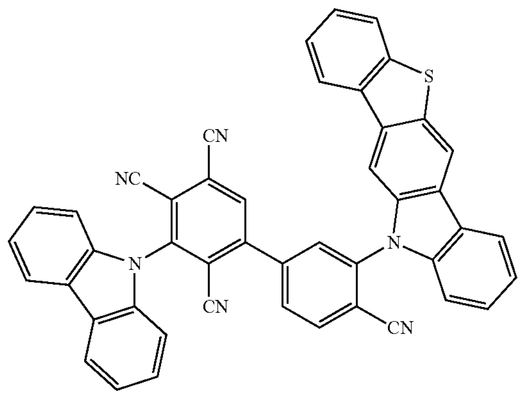
215
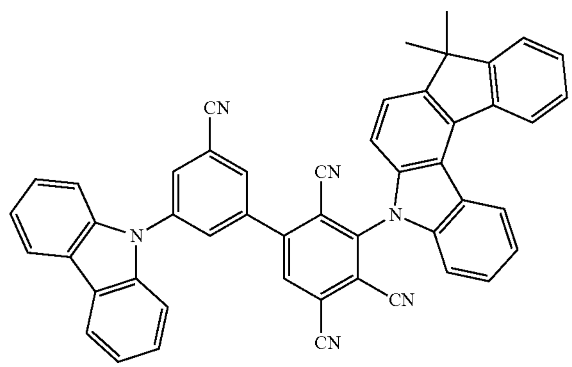
216
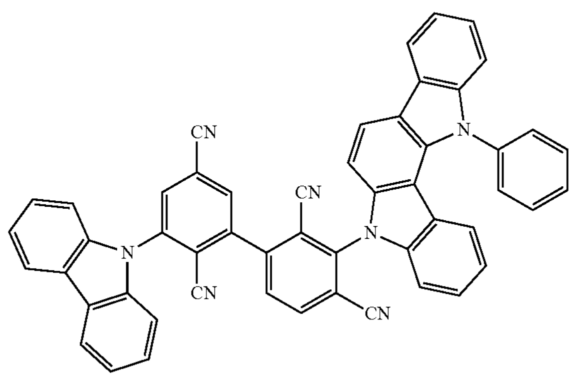
217
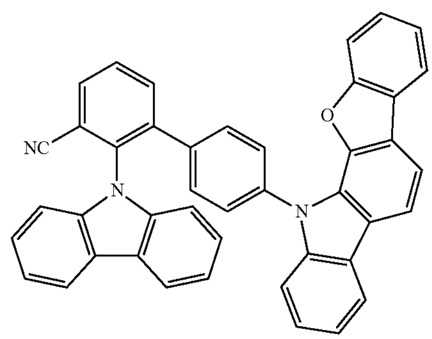
218
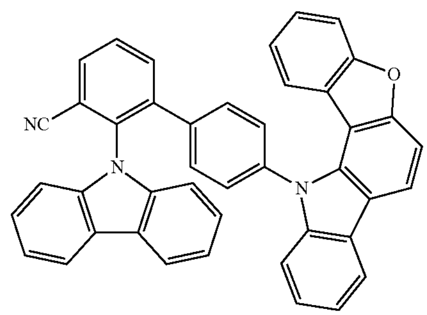

-continued
219
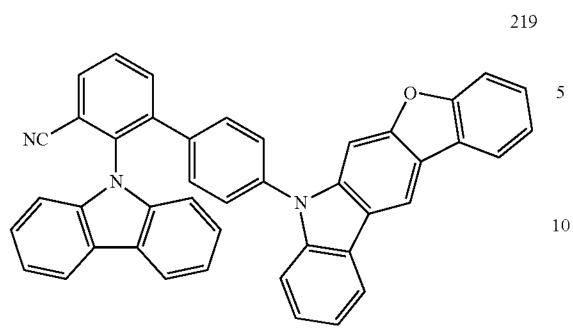
220
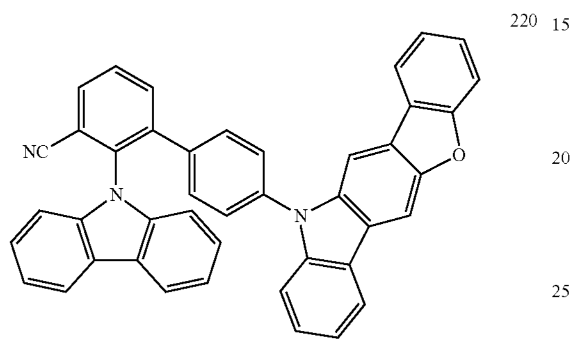
221
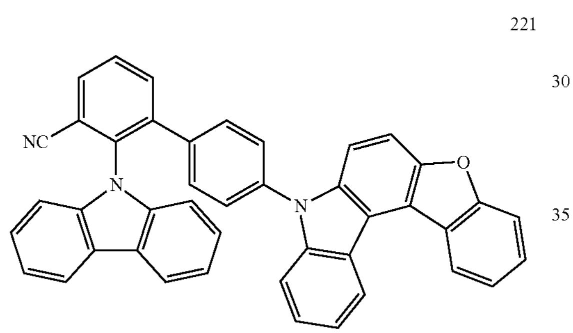
222
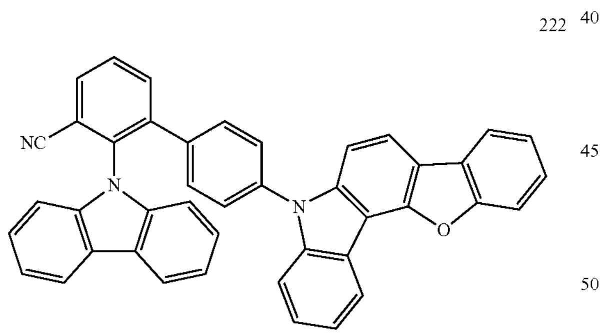
223
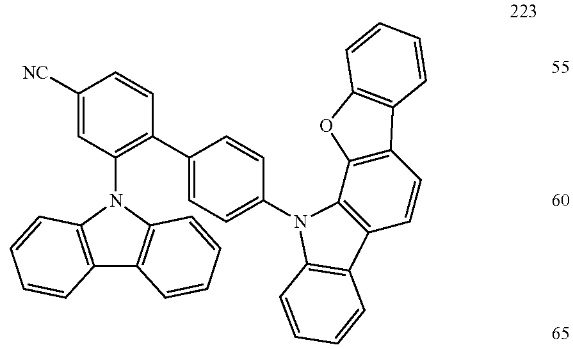
-continued
224
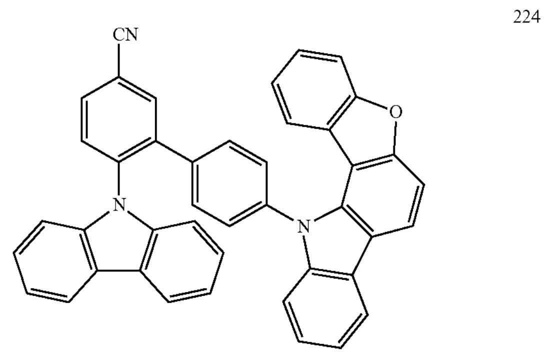
225
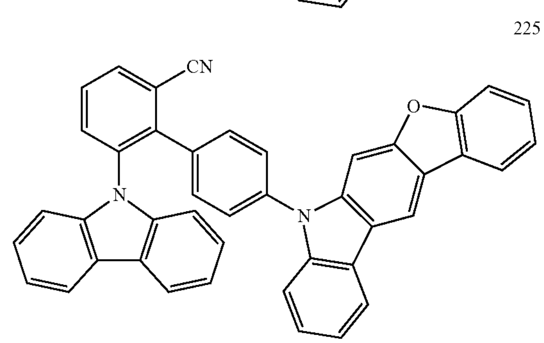
226
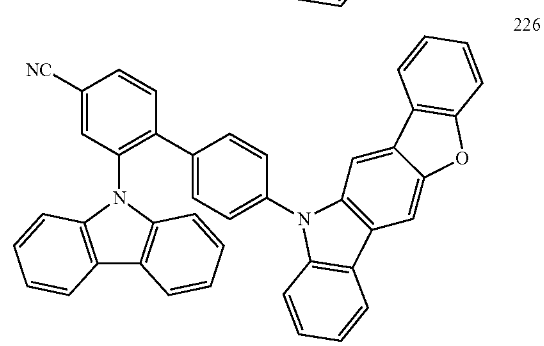
227
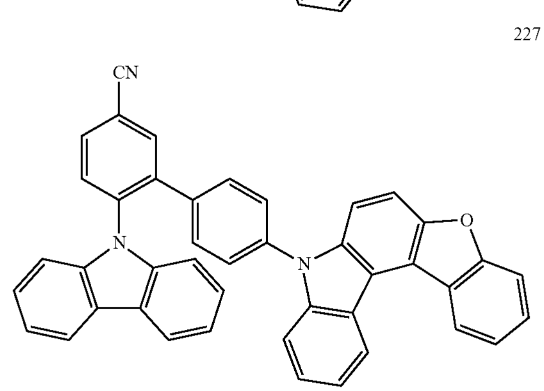
228
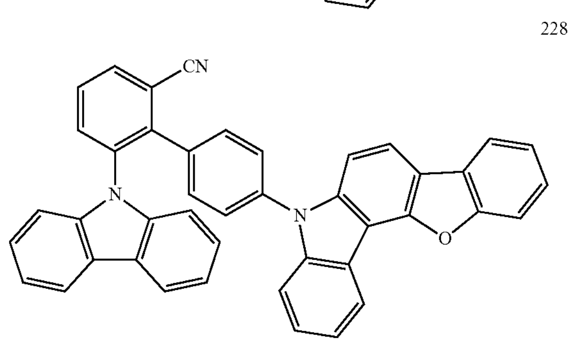

-continued
229
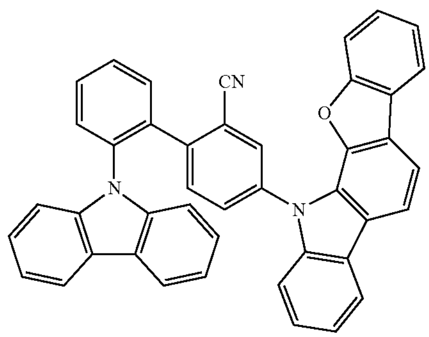
230
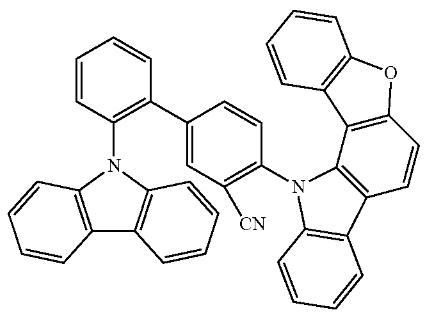
231
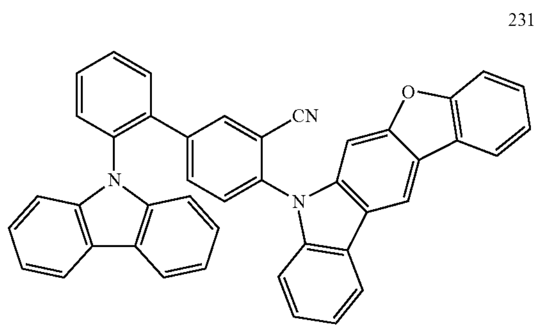
232
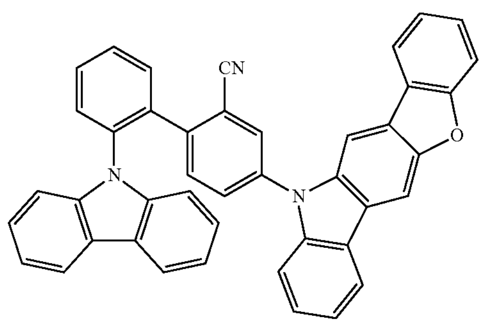
233
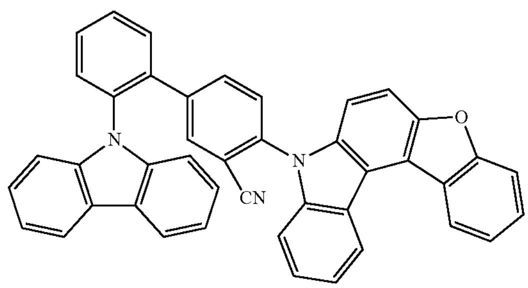
-continued
234
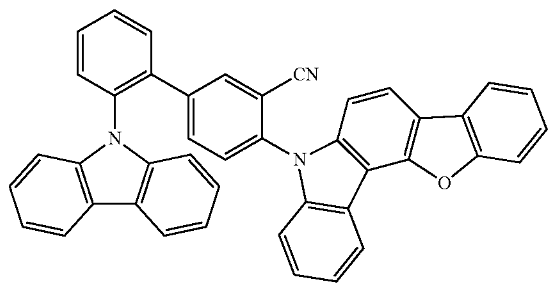
235
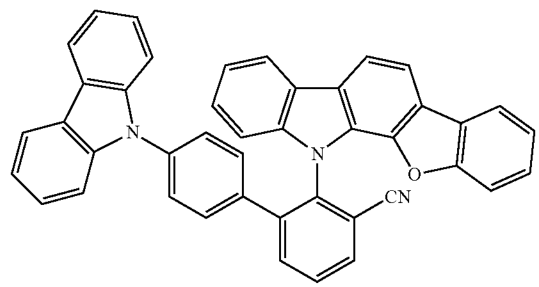
236
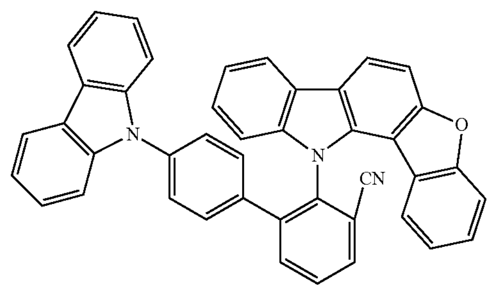
237
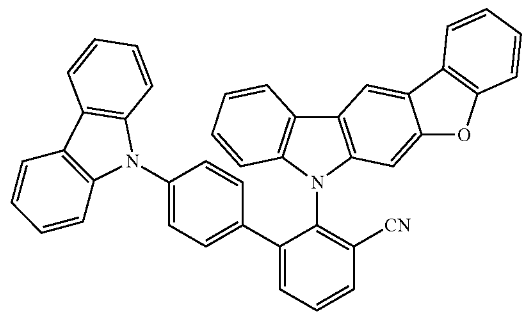
238
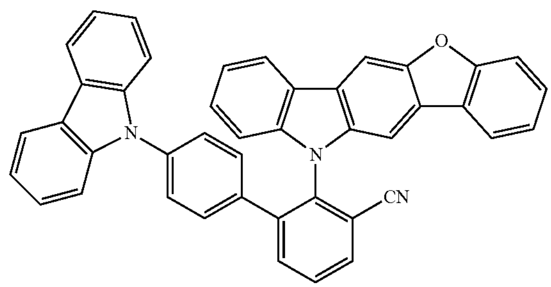

-continued
239
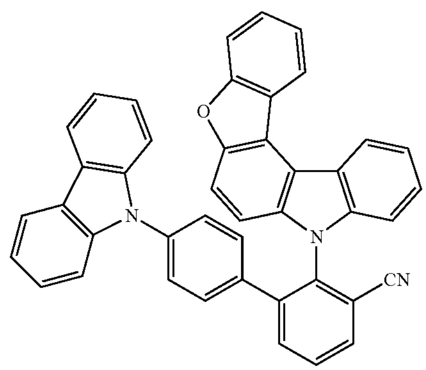
240
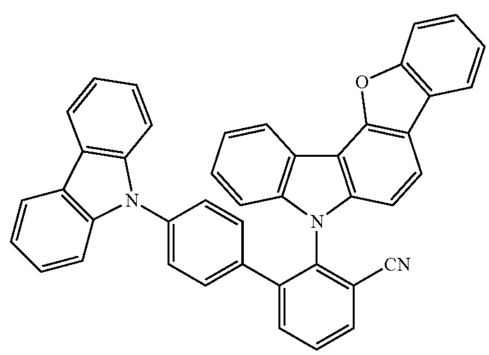
241
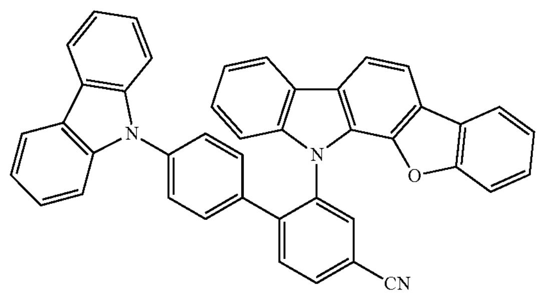
242
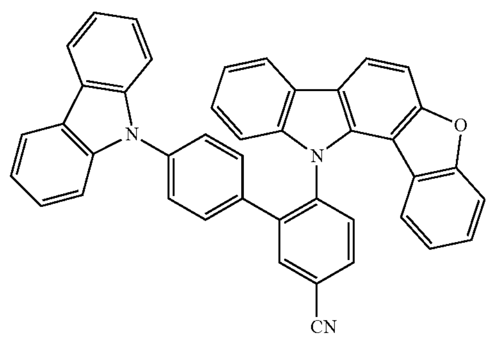
-continued
243
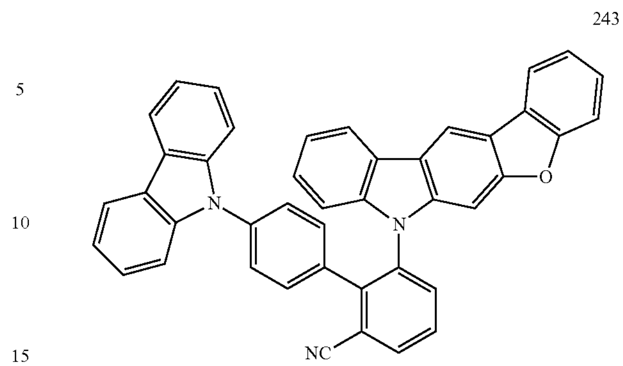
244
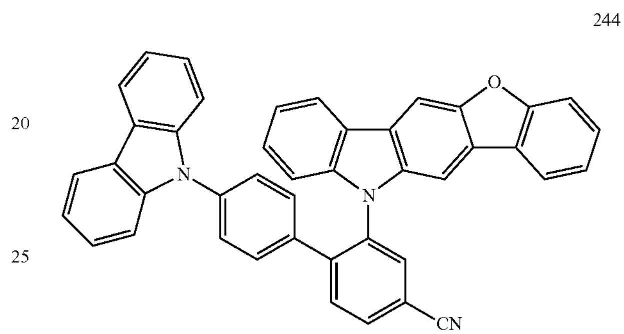
245
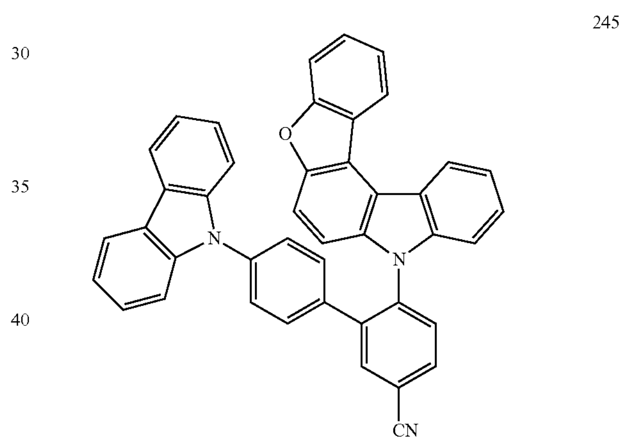
246
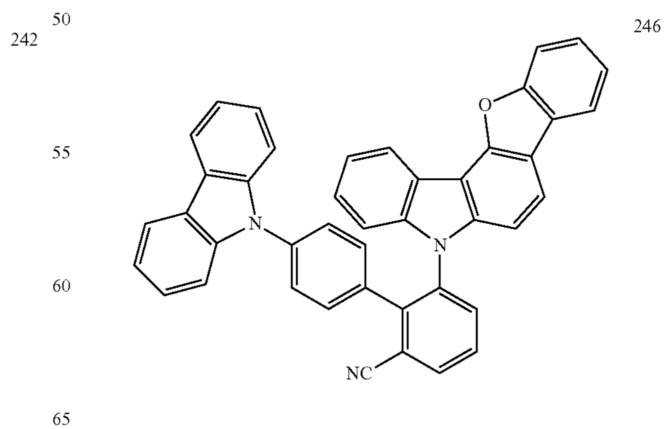

247
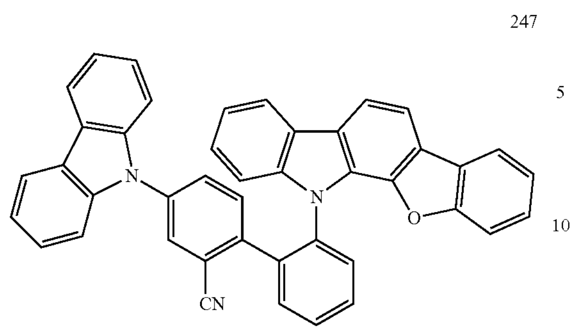
248
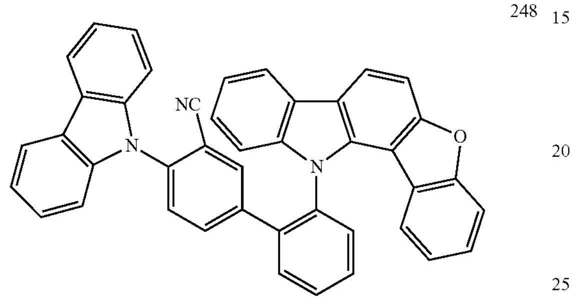
249
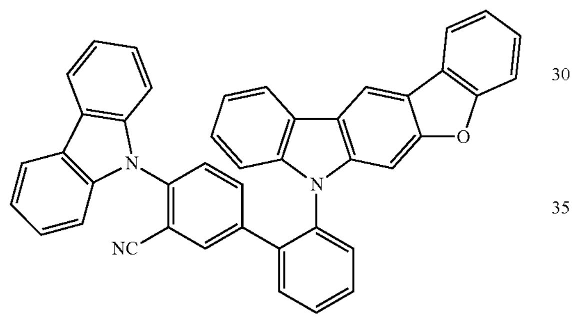
250
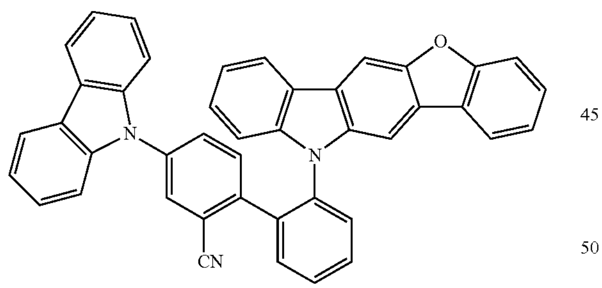
251
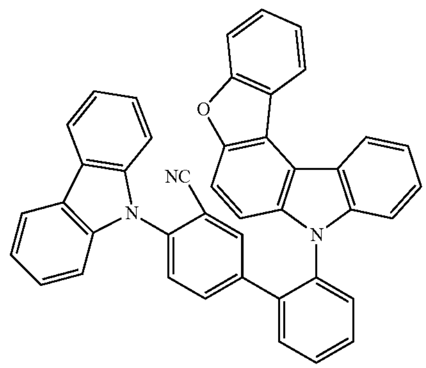
252
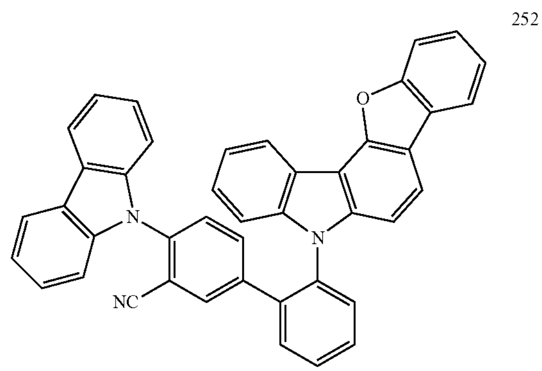
253
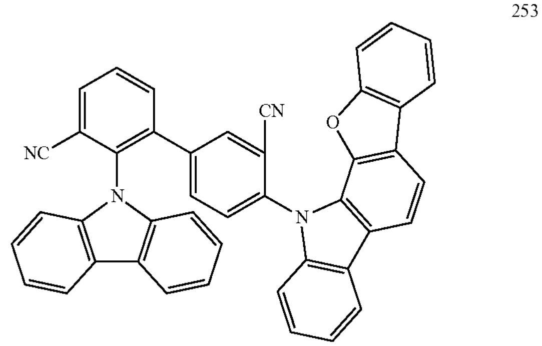
254
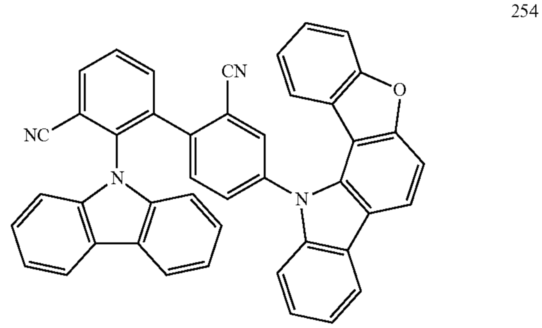
255
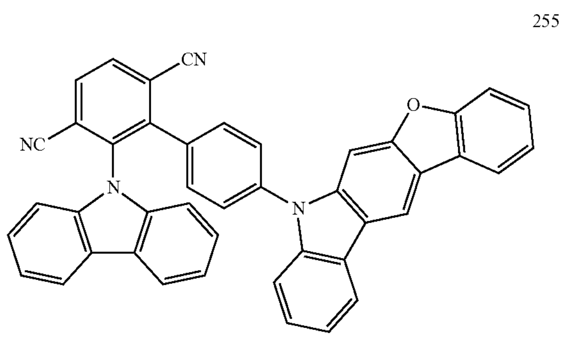

-continued
256
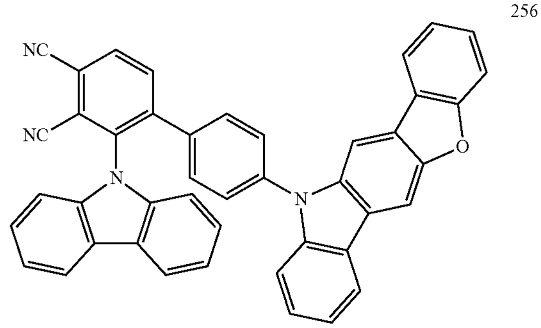
257
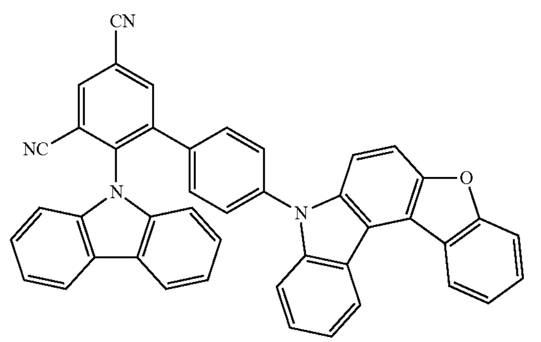
258
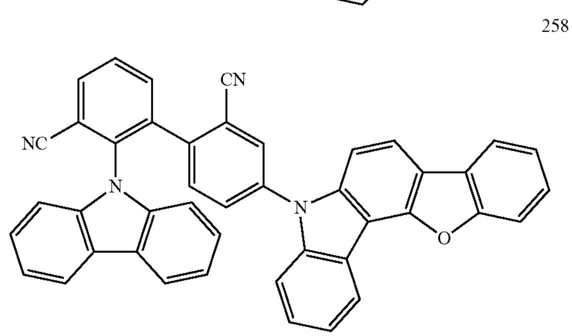
259
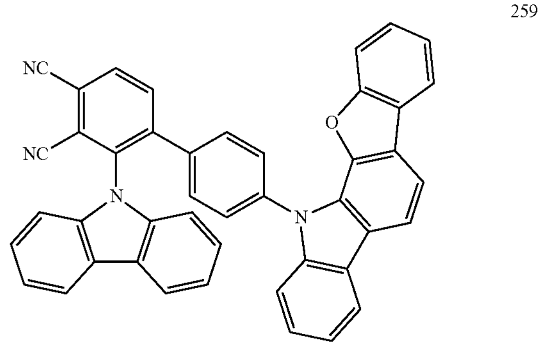
260
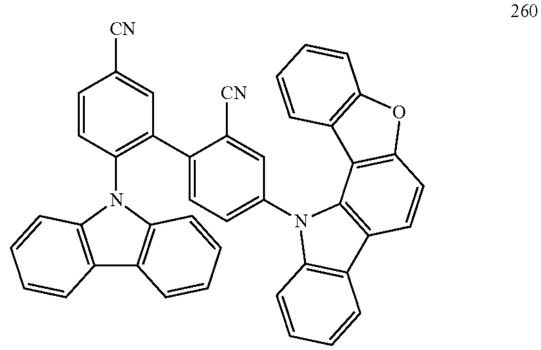
-continued
261
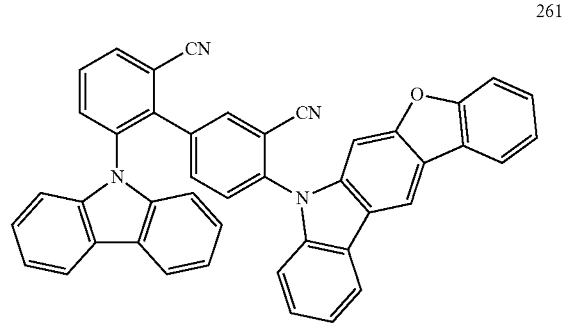
262
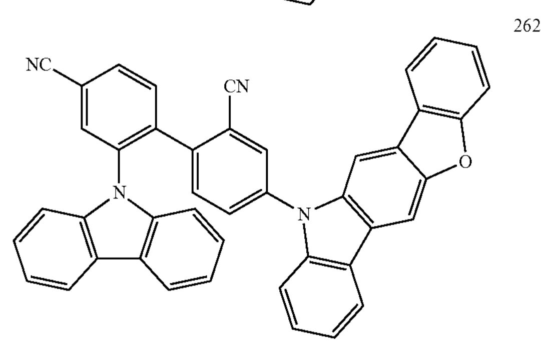
263
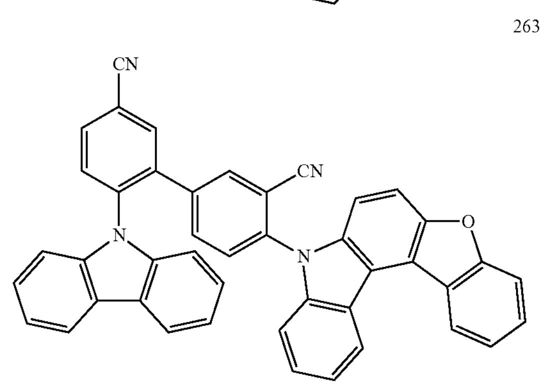
264
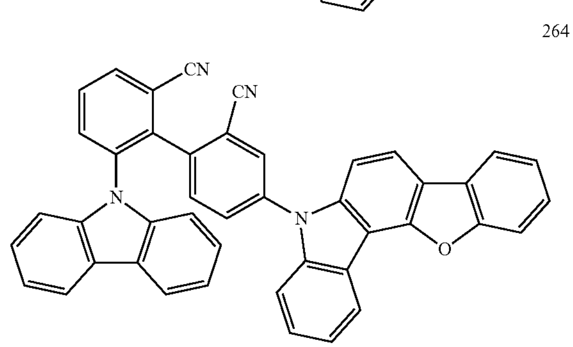
265
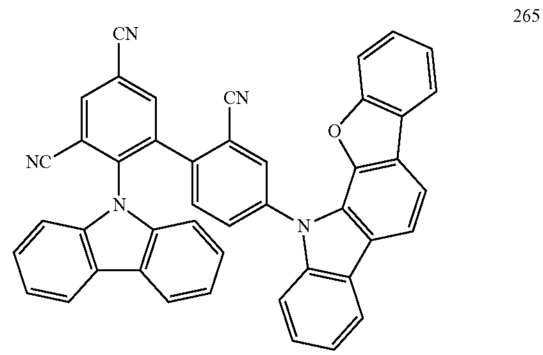

266
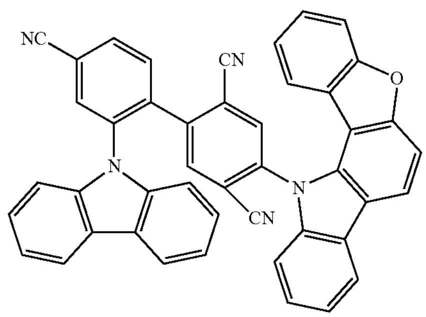
267
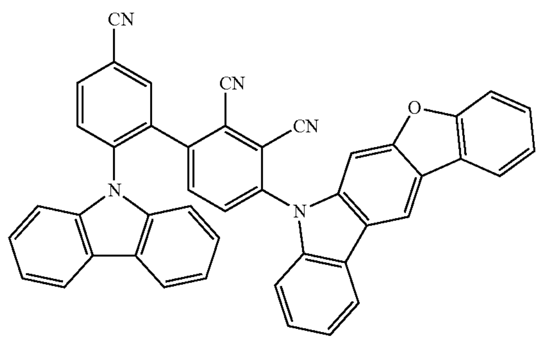
268
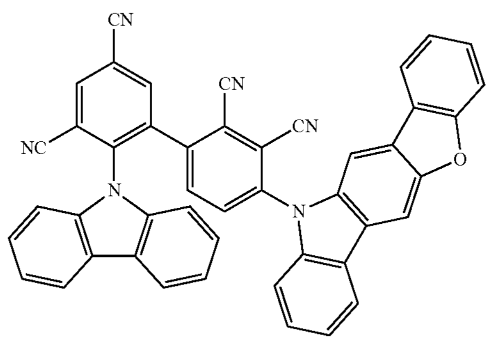
269
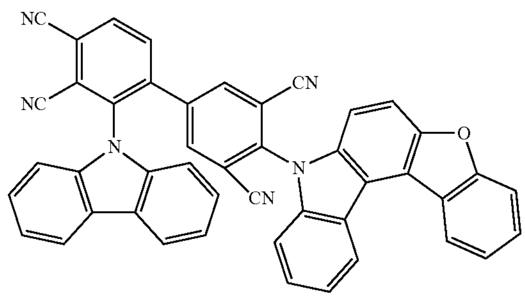
270
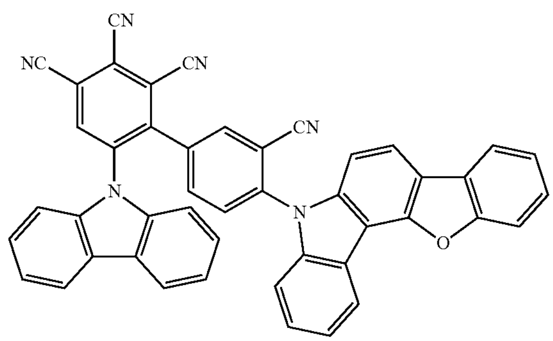
271
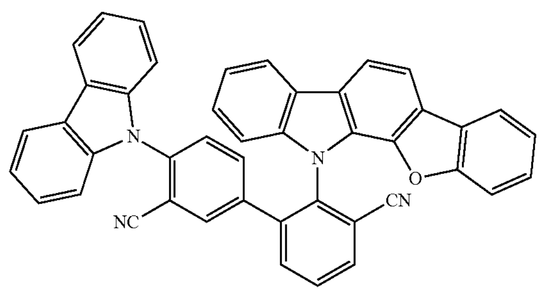
272
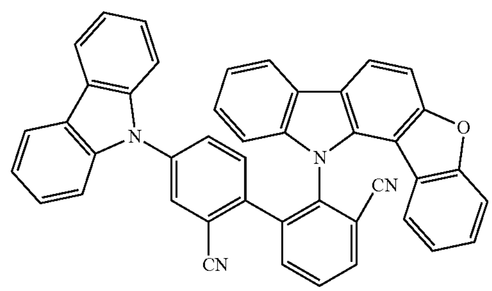
273
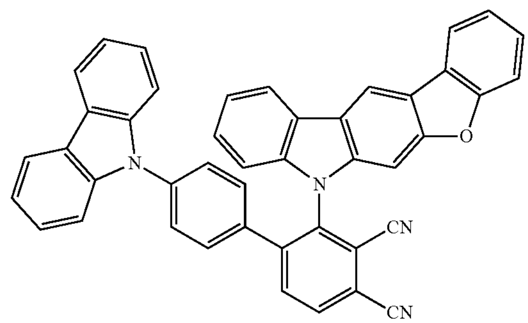
274
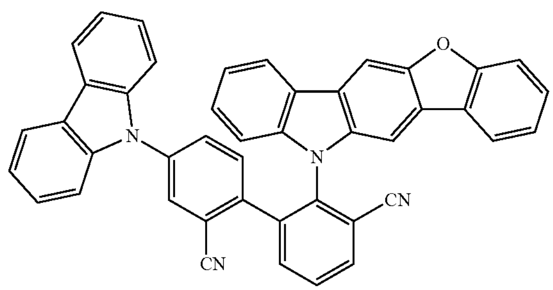

-continued
275
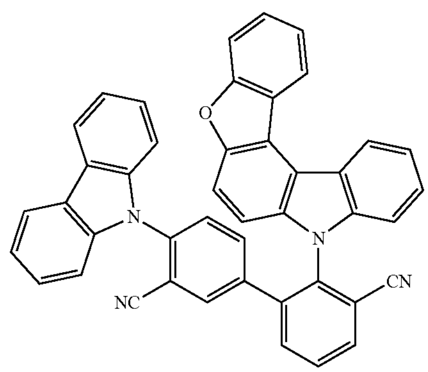
276
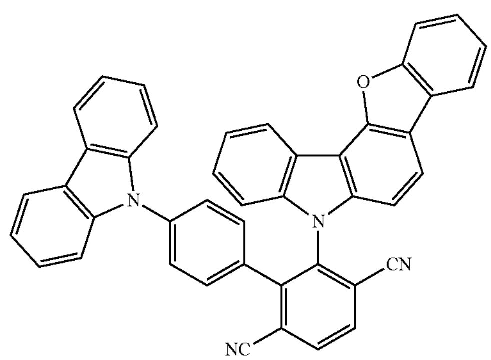
277
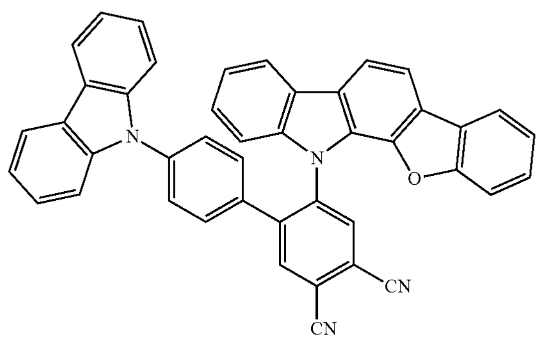
278
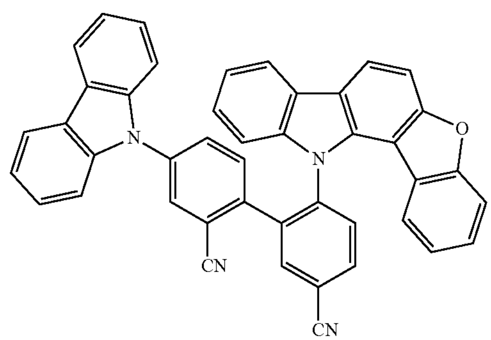
-continued
279
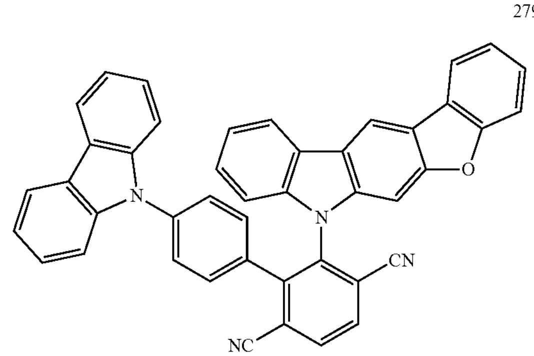
280
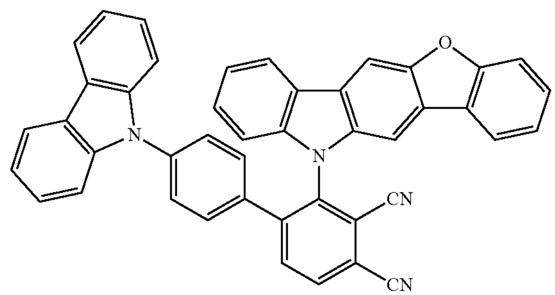
281
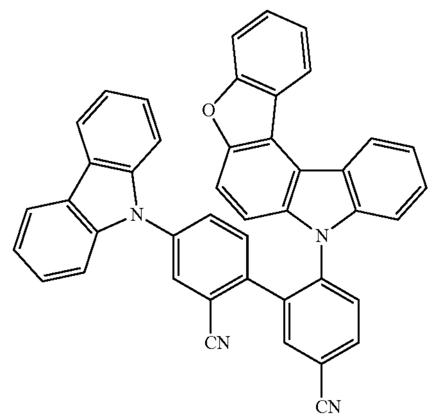
282
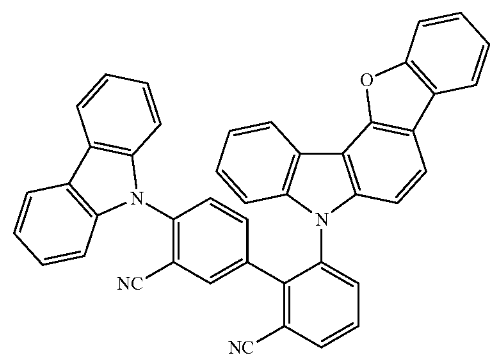

-continued
283
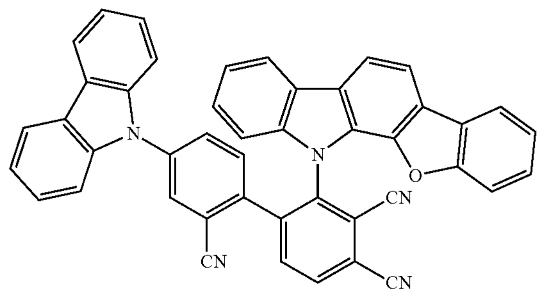
284
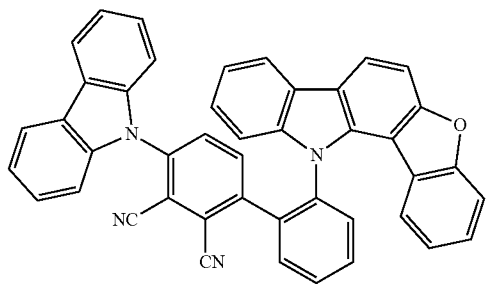
285
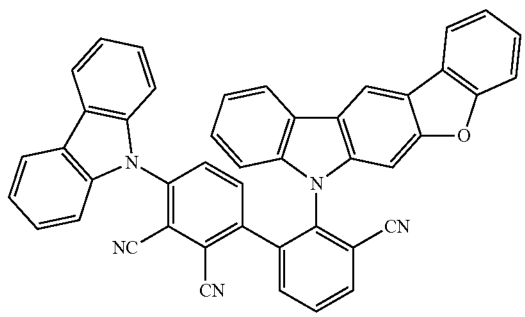
286
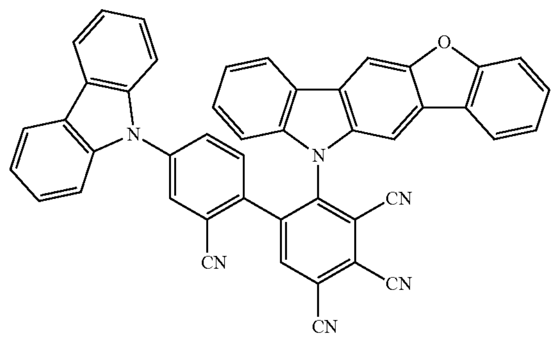
-continued
287
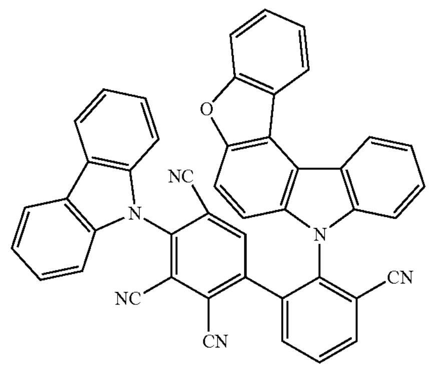
288
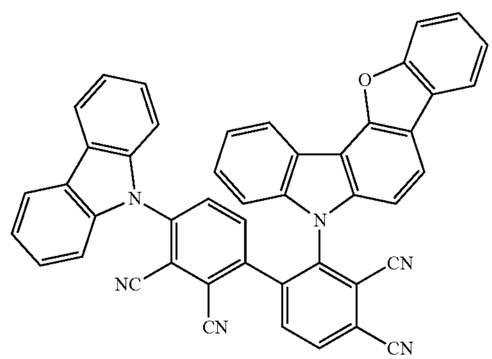
289
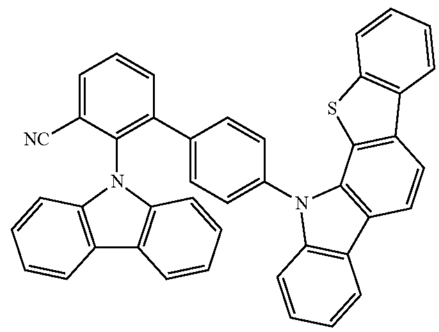
290
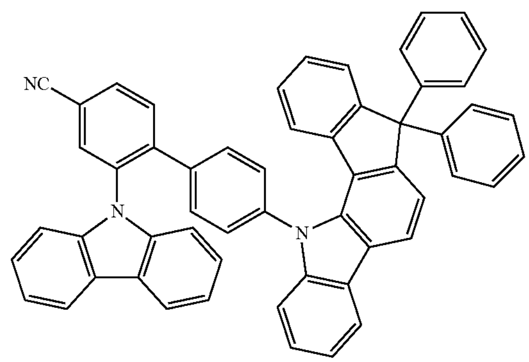

-continued
291
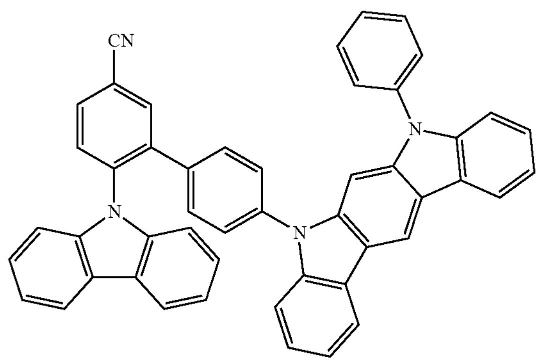
292
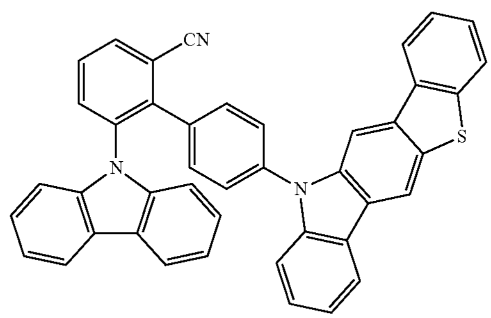
293
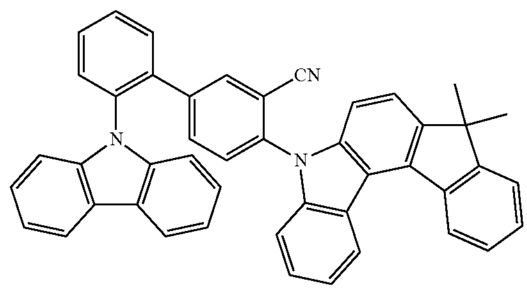
294
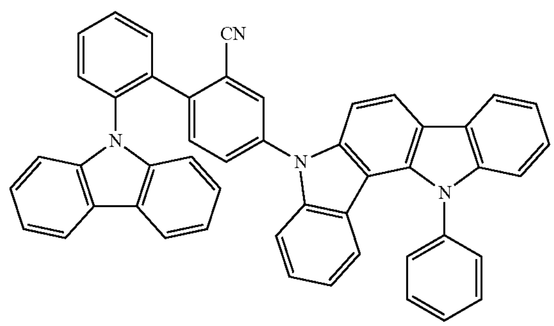
-continued
295
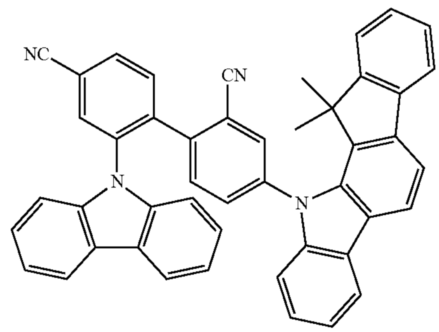
296
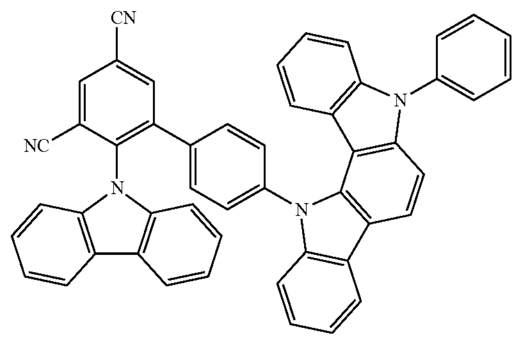
297
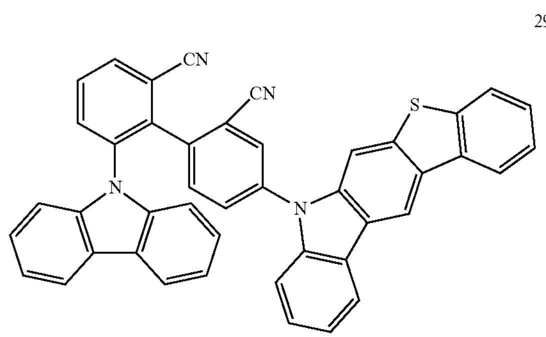
298
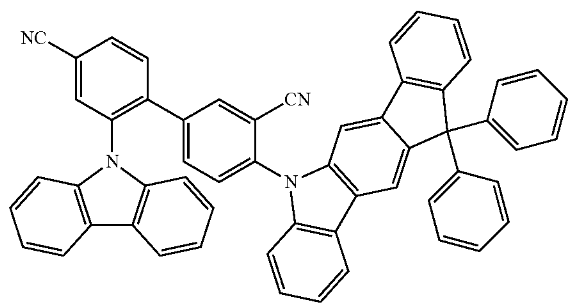

-continued
299
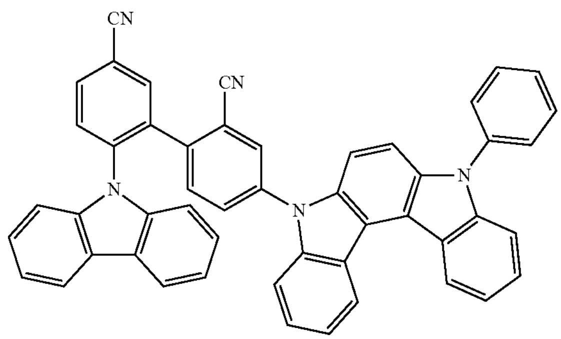
300
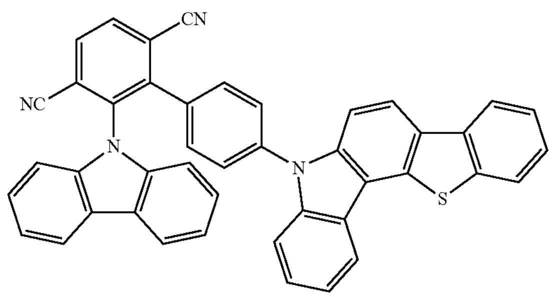
301
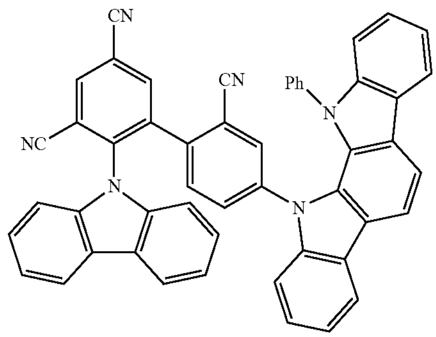
302
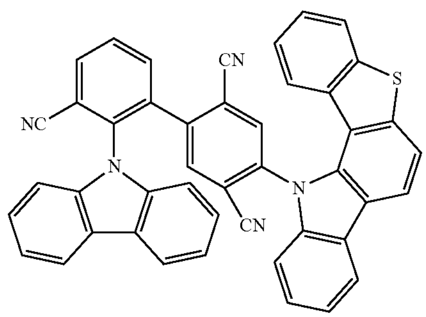
303
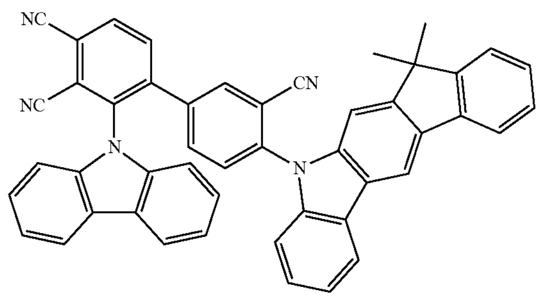
-continued
304
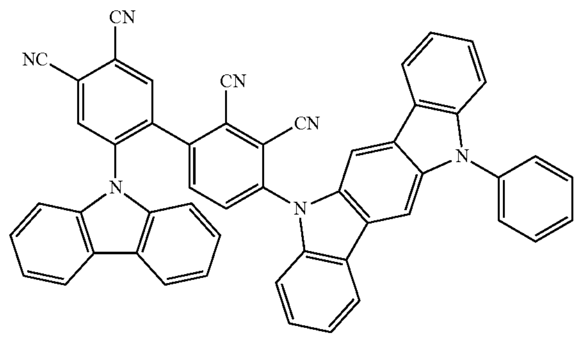
305
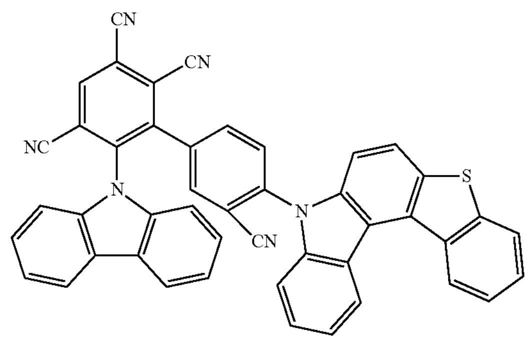
306
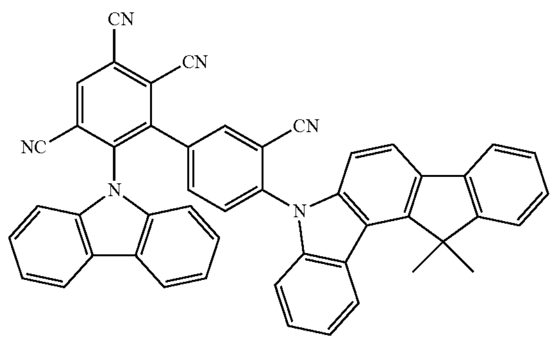
307
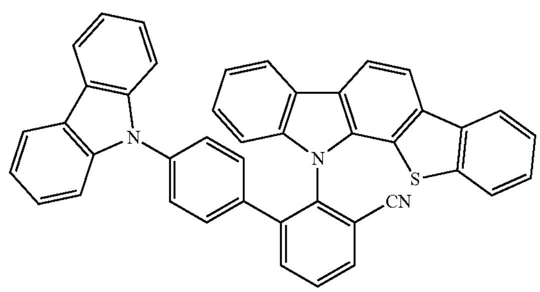

-continued
308
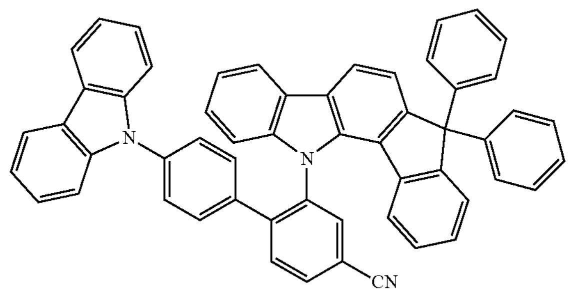
309
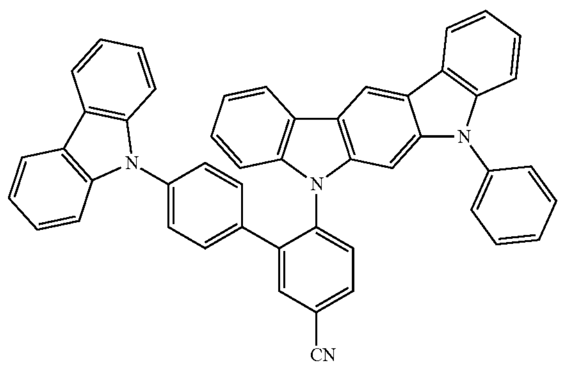
310
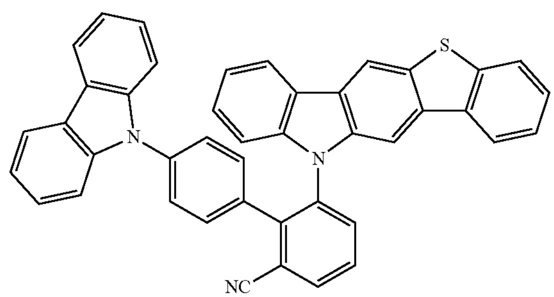
311
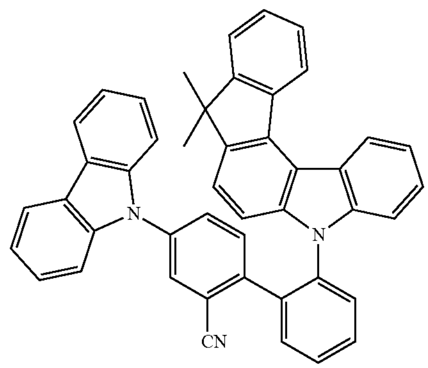
-continued
312
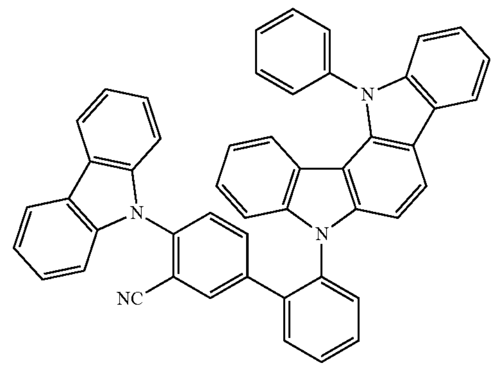
313
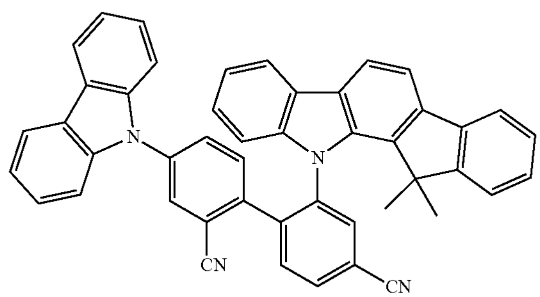
314
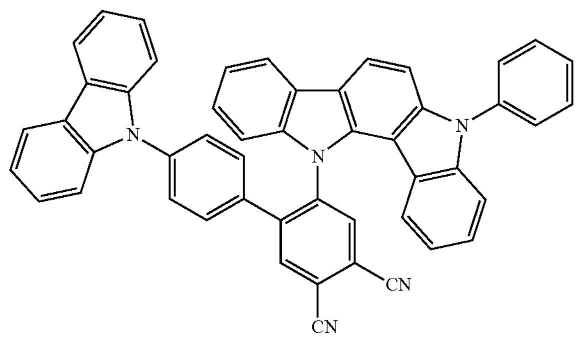
315
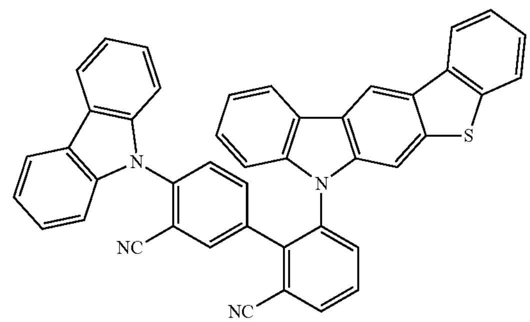

-continued
316
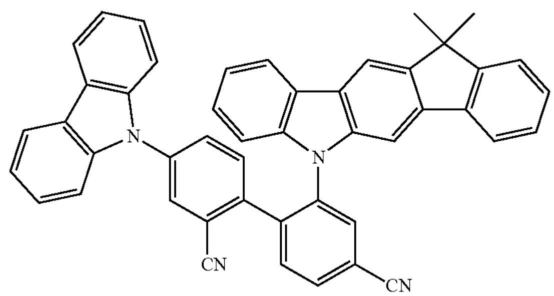
317
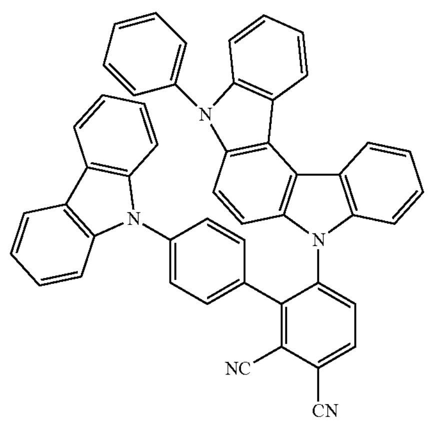
318
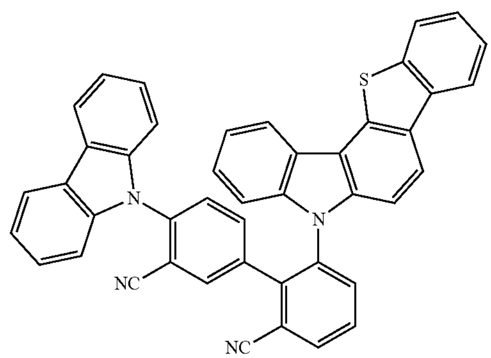
319
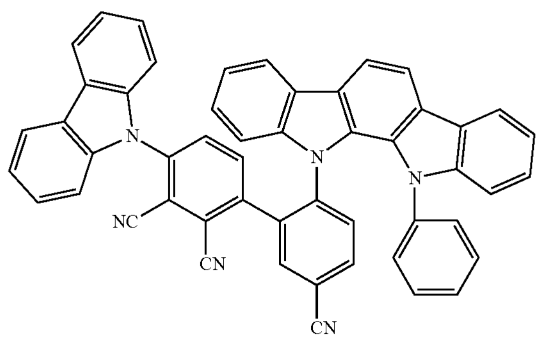
-continued
320
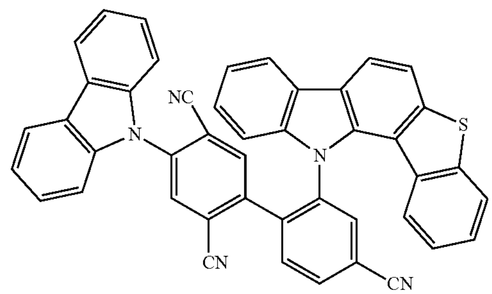
321
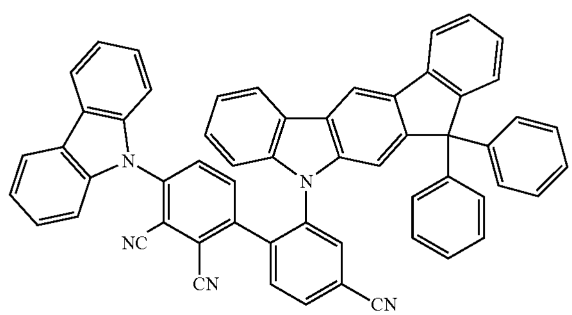
322
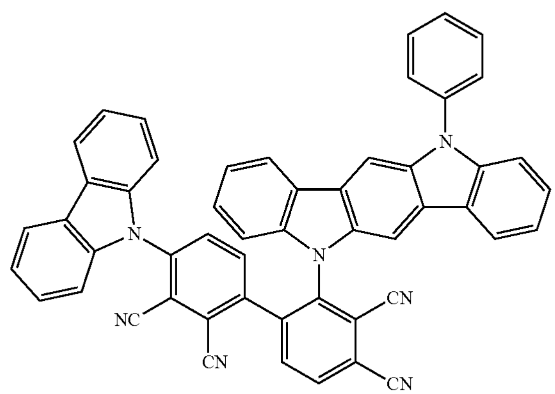
323
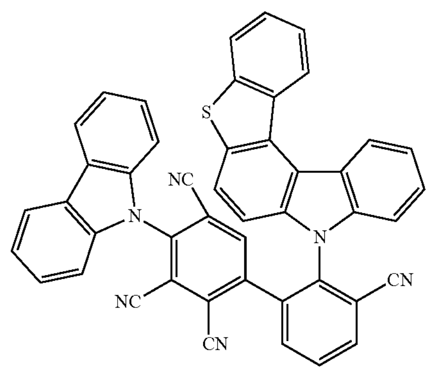

-continued
324
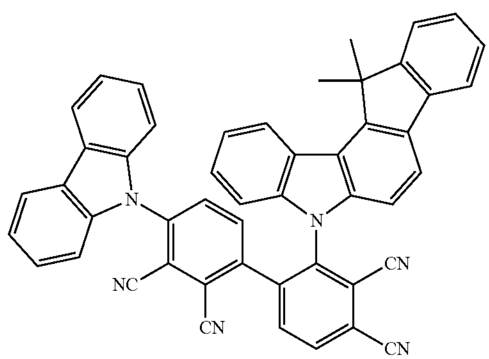
325
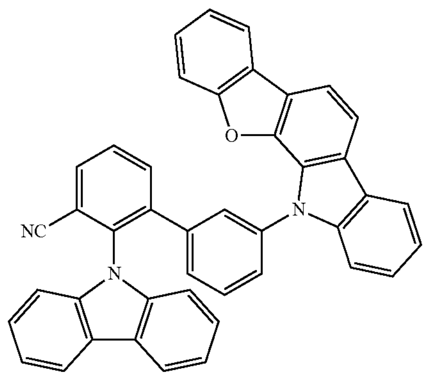
326
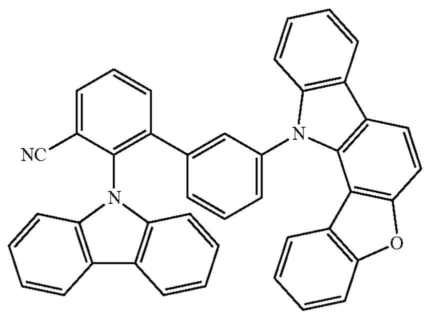
327
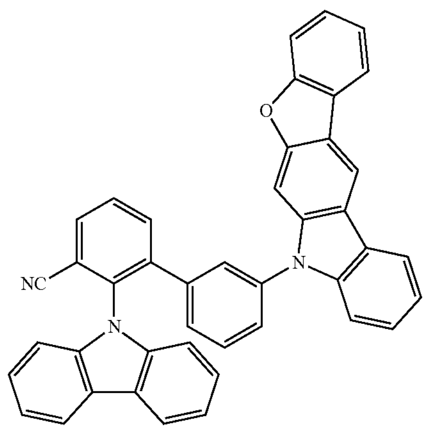
-continued
328
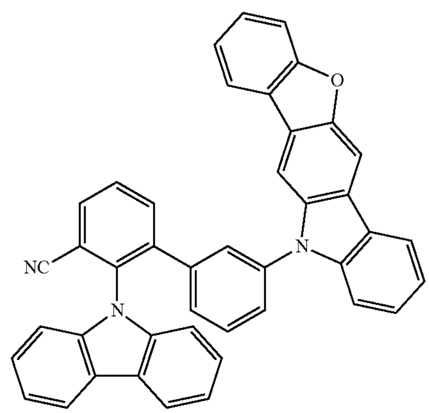
329
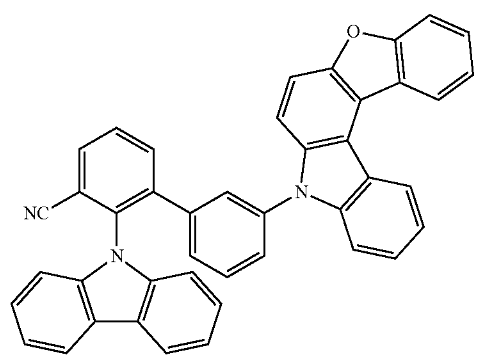
330
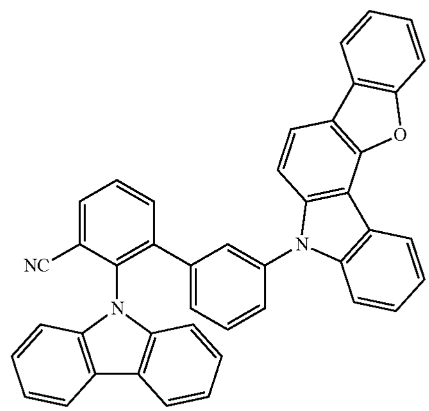
331
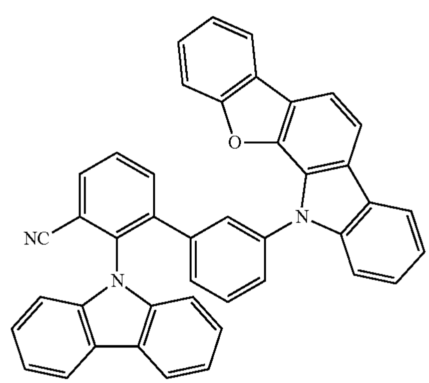

-continued
332
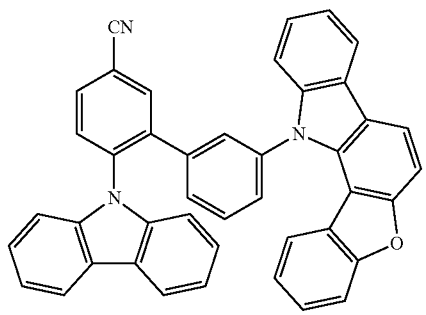
333
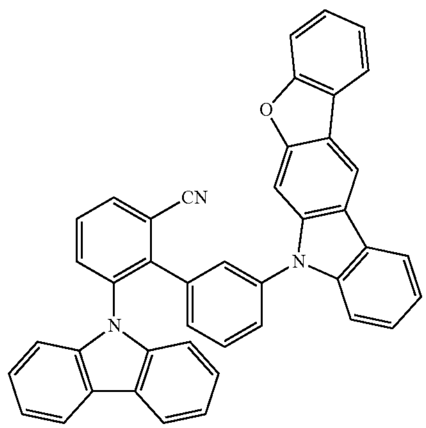
334
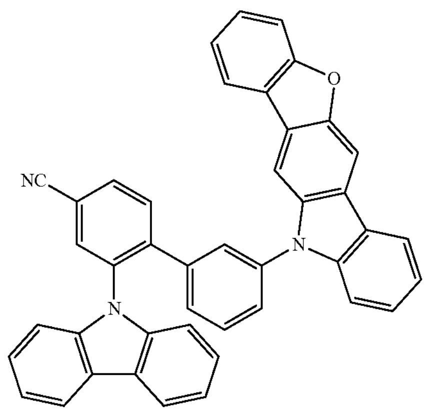
335
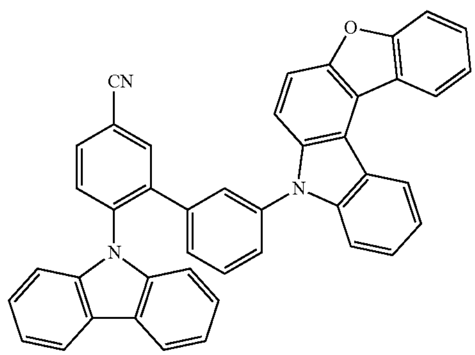
-continued
336
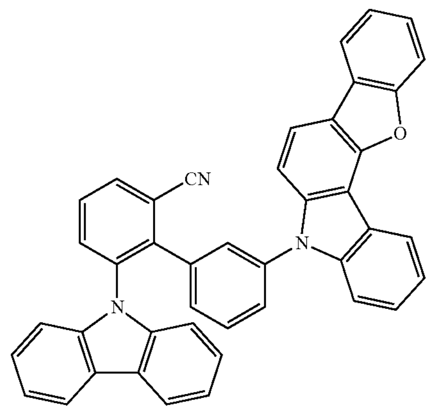
337
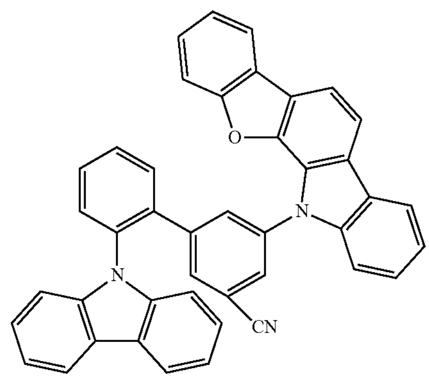
338
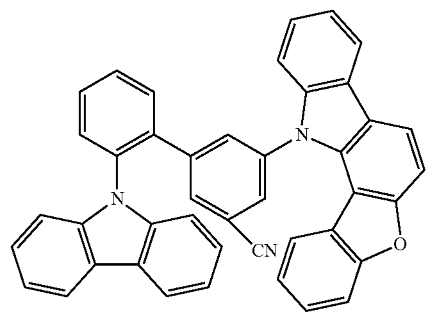
339
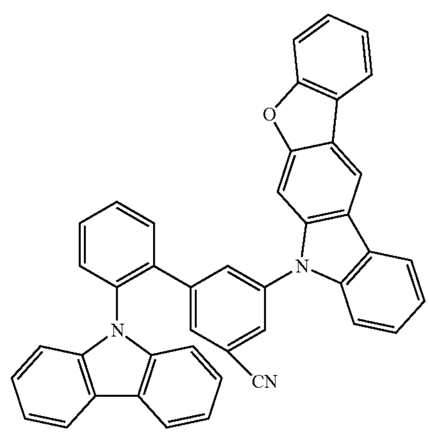

-continued
340
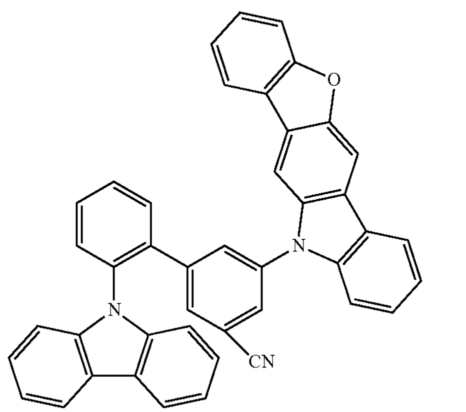
341
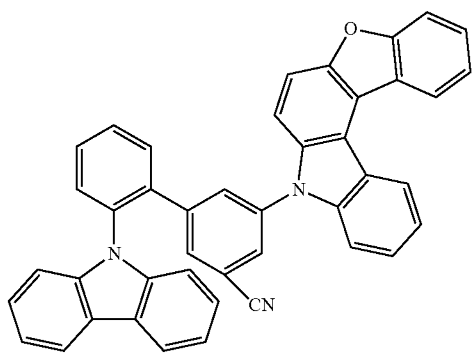
342
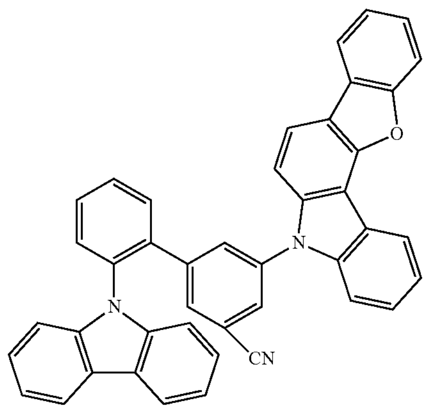
343
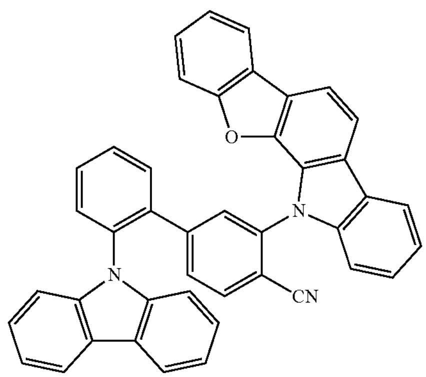
-continued
344
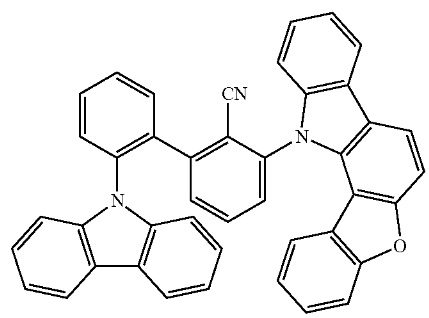
345
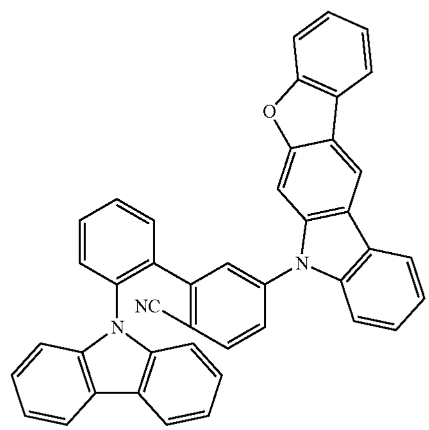
346
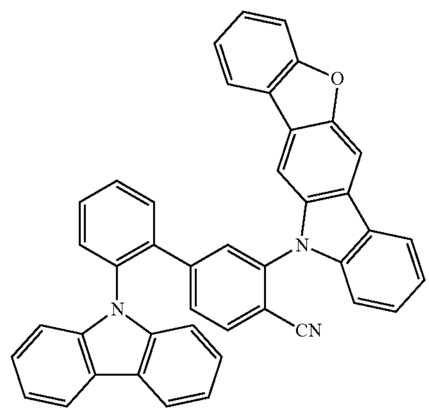
347
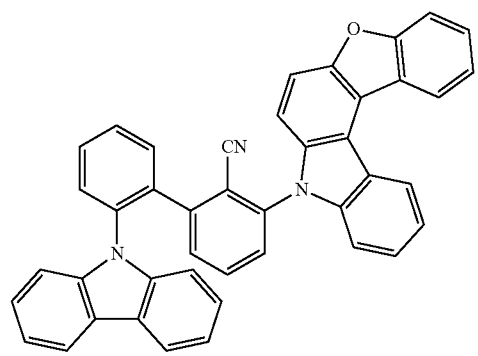

-continued
348
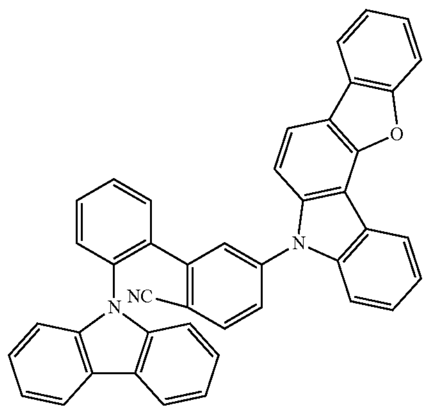
349
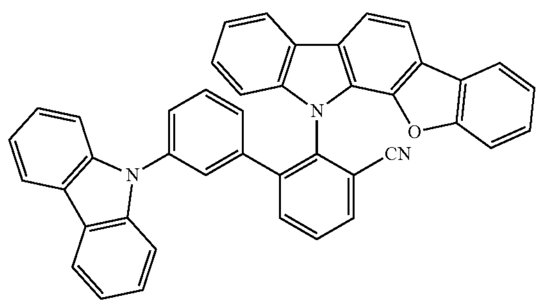
350
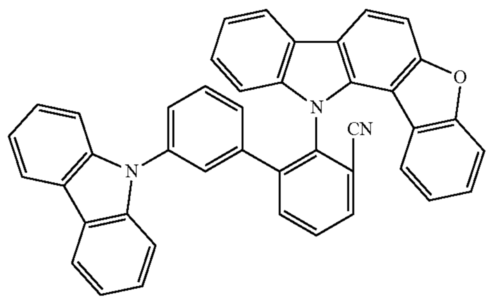
351
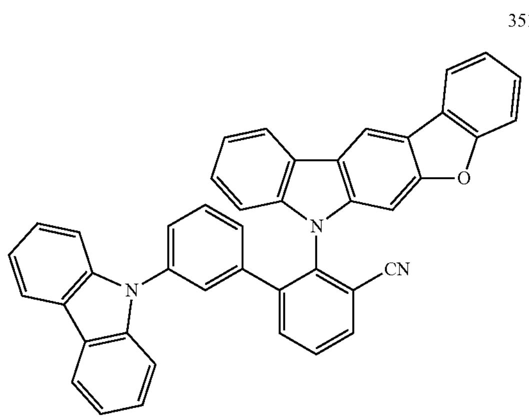
-continued
352
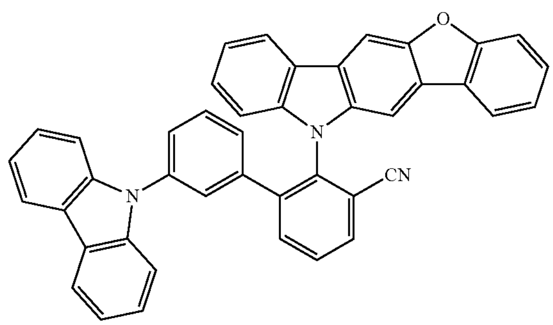
353
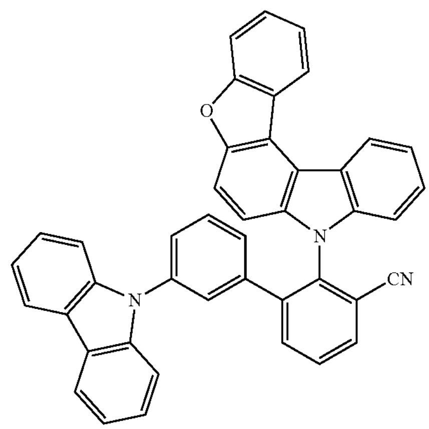
354
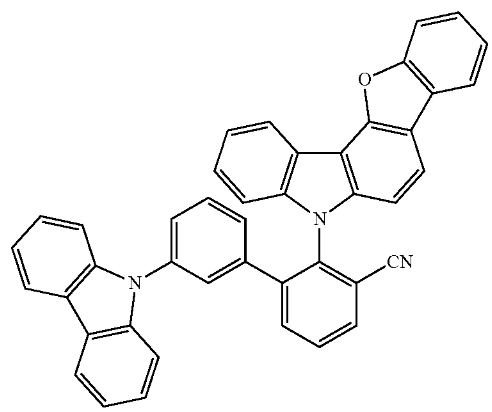
355
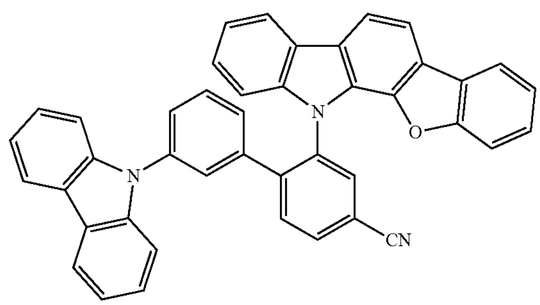

356
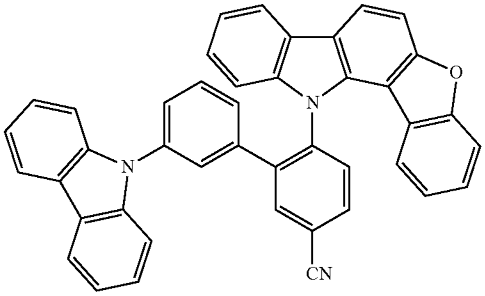
357
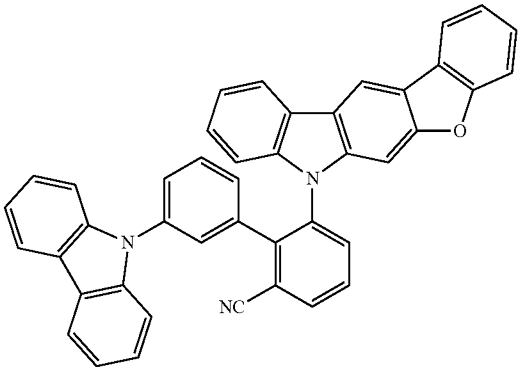
358
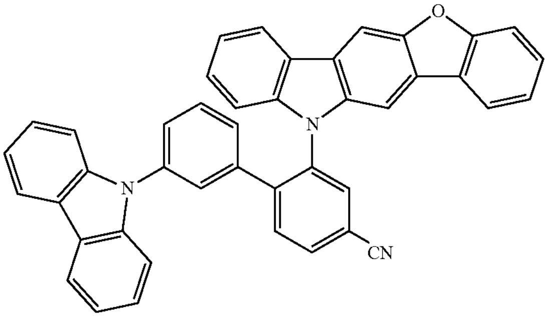
359
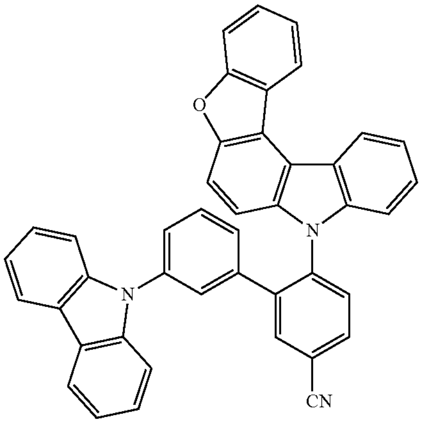
360
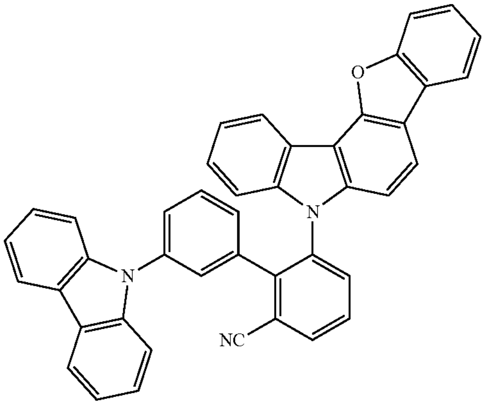
361
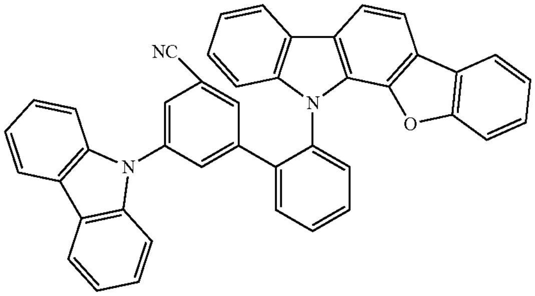
362
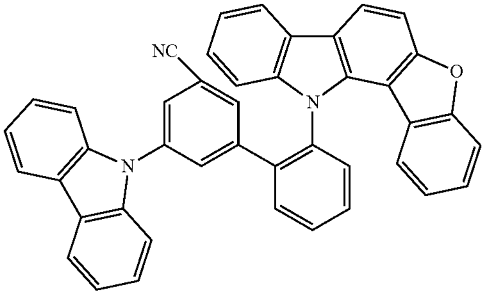
363
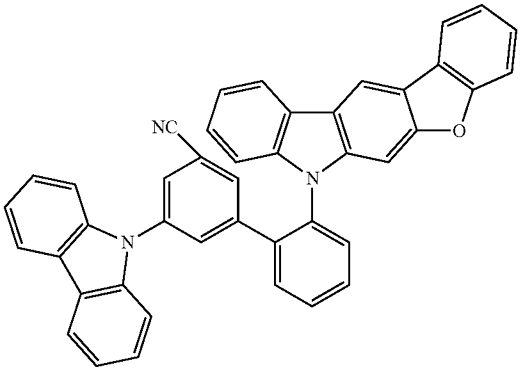

364
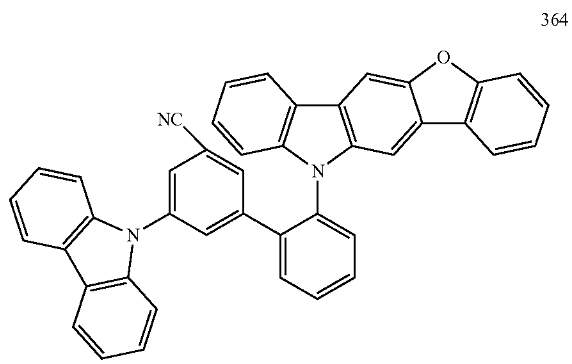
365
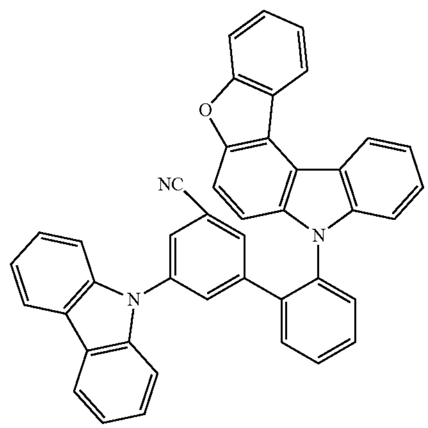
366
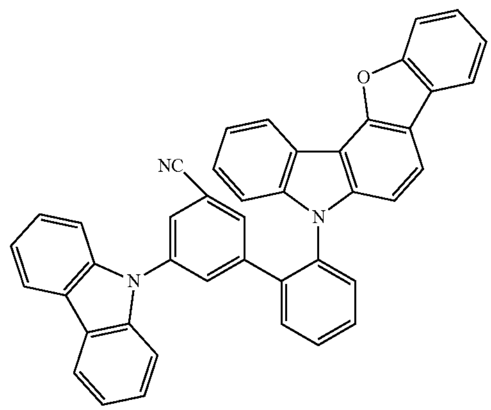
367
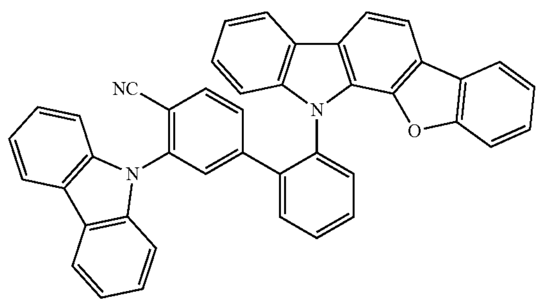
368
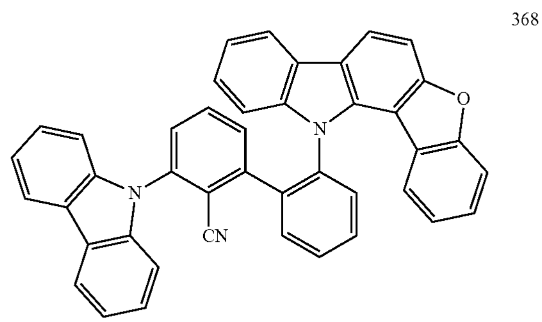
369
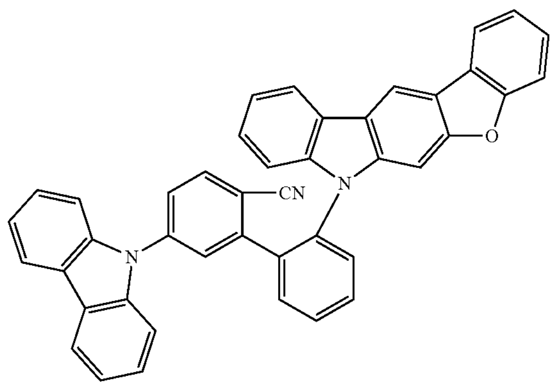
370
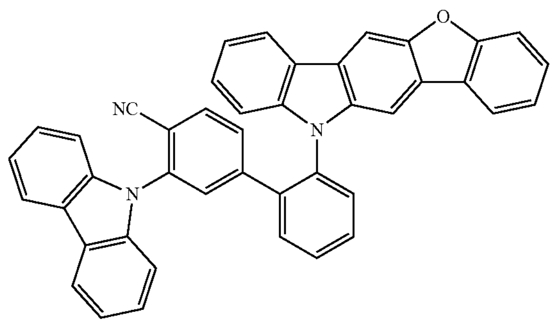
371
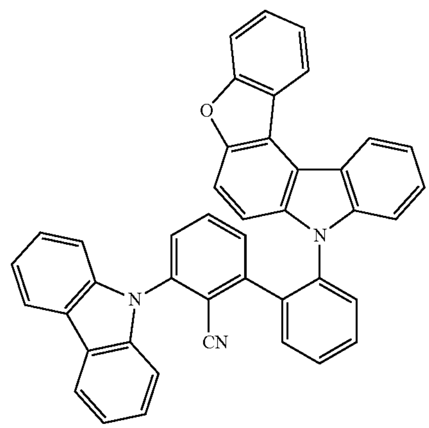

-continued
372
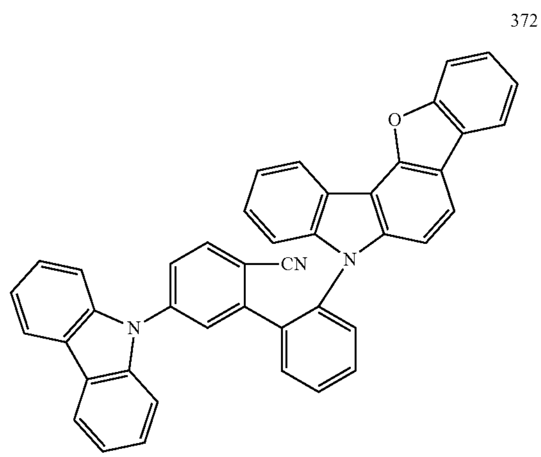
373
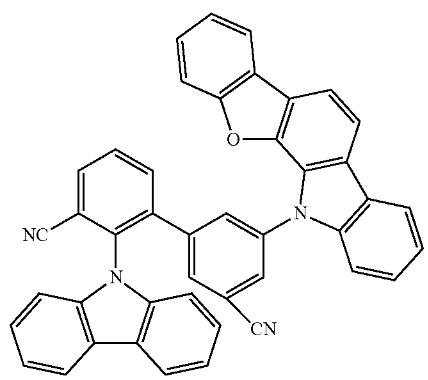
374
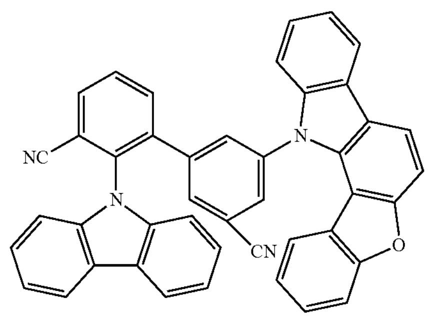
375
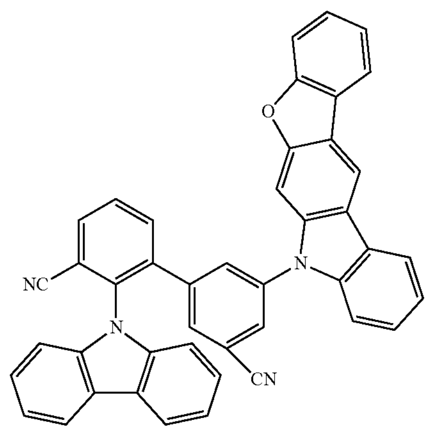
-continued
376
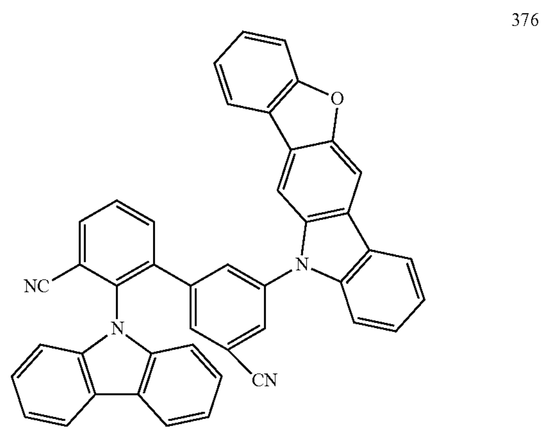
377
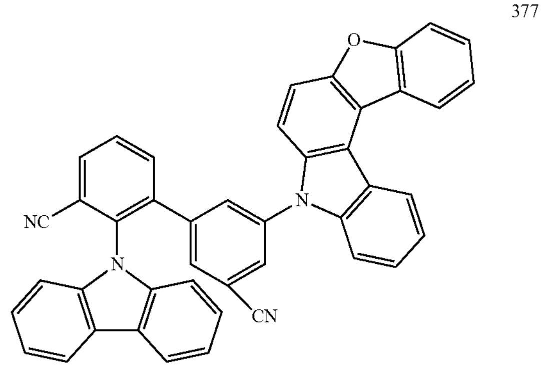
378
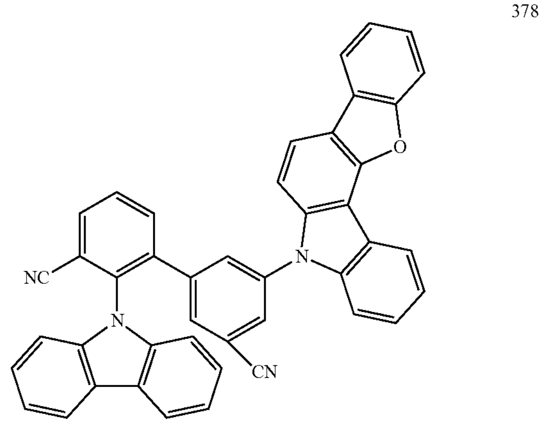
379
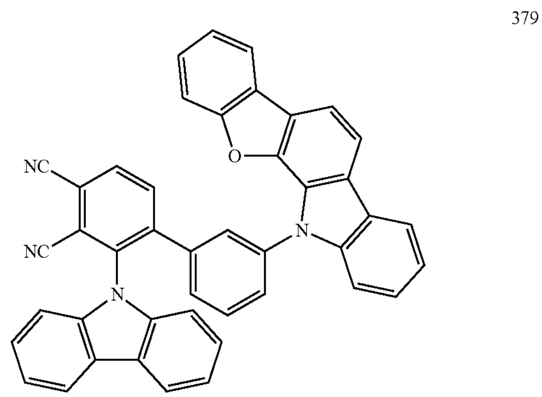

-continued
380
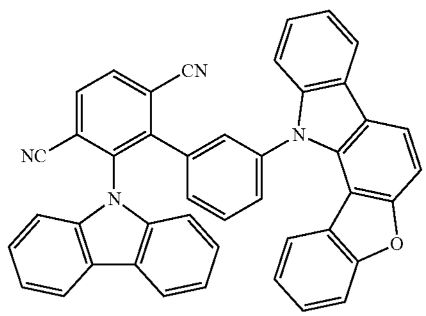
381
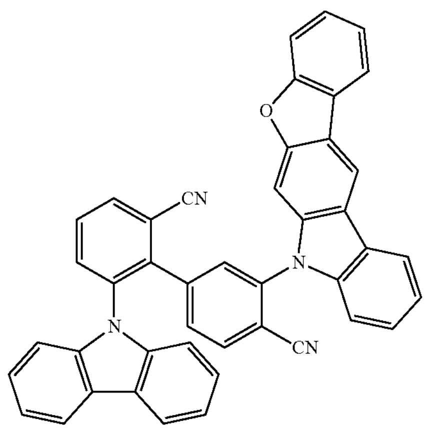
382
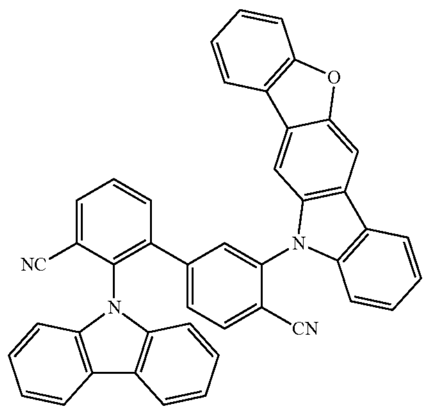
383
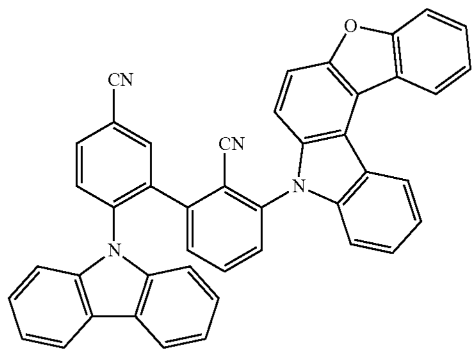
-continued
384
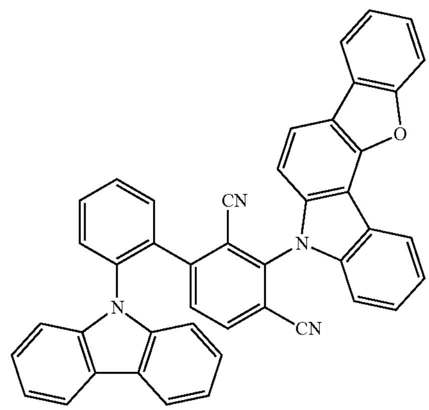
385
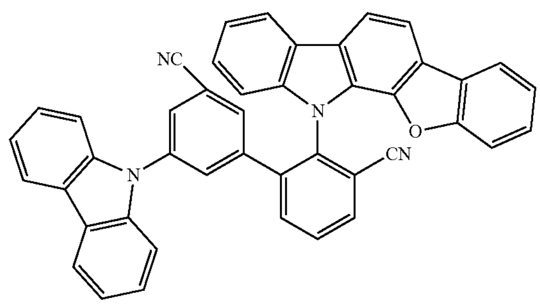
386
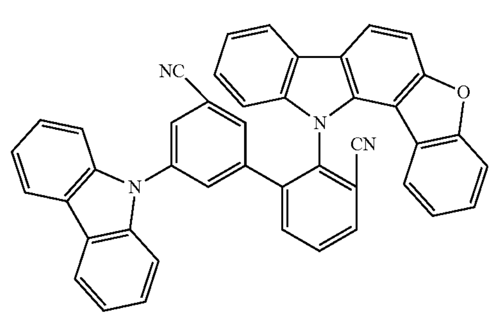
387
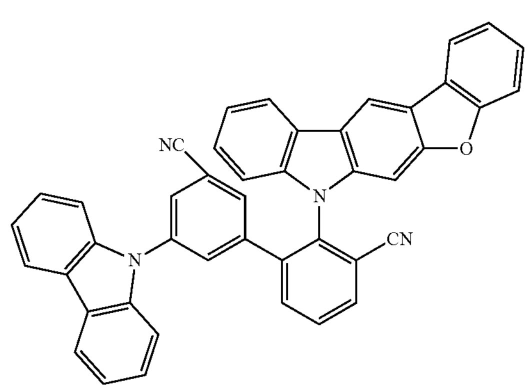

-continued
388
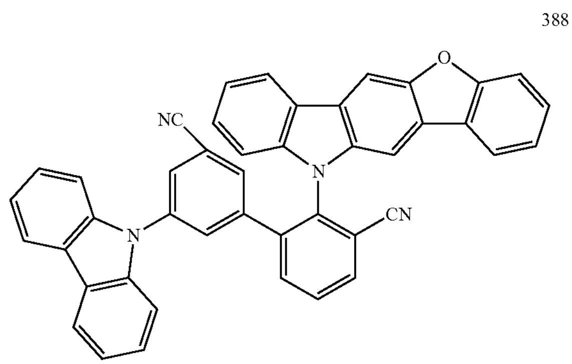
389
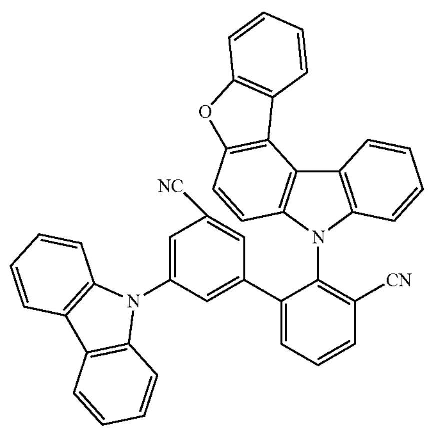
390
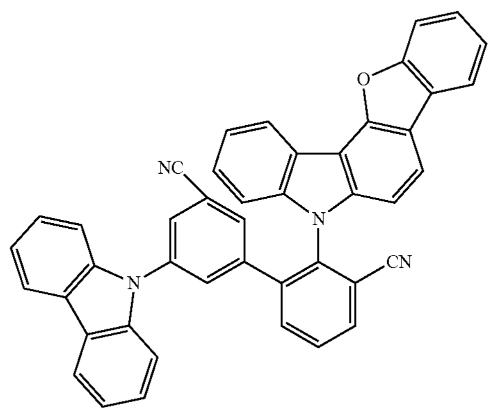
391
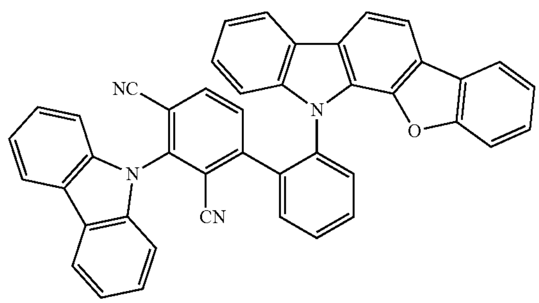
-continued
392
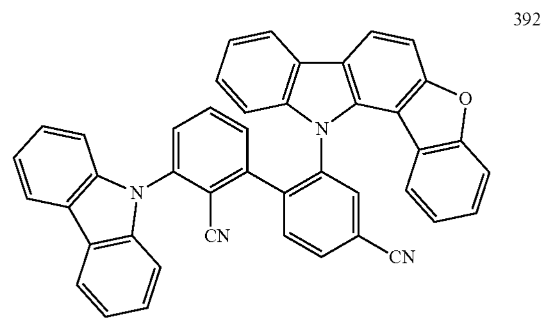
393
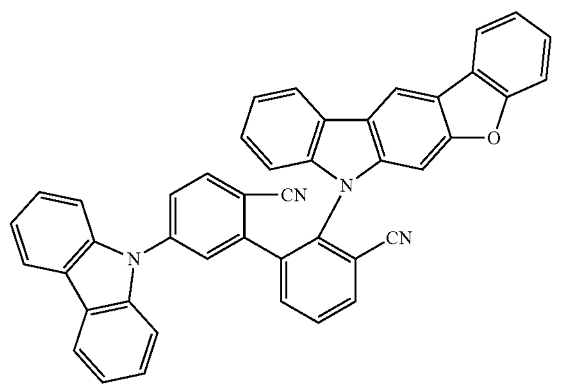
394
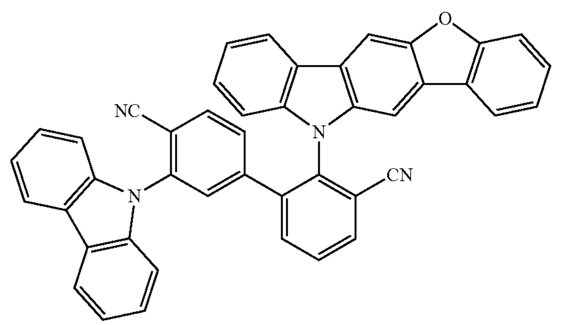
395
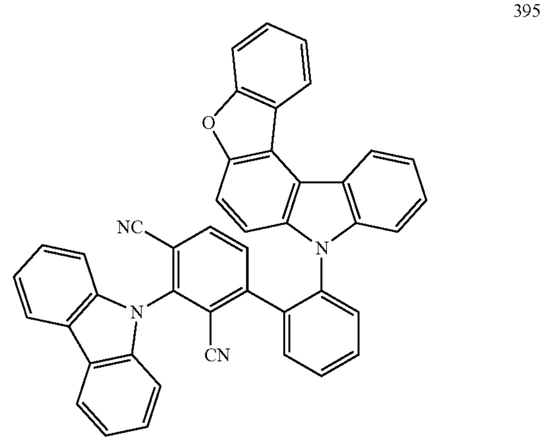

-continued
396
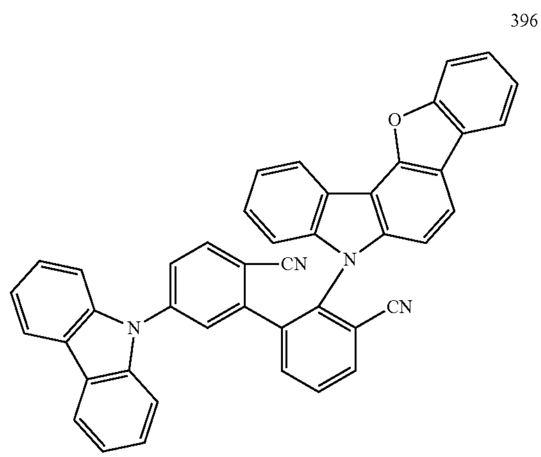
397
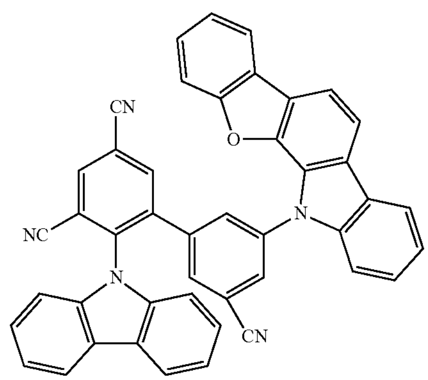
398
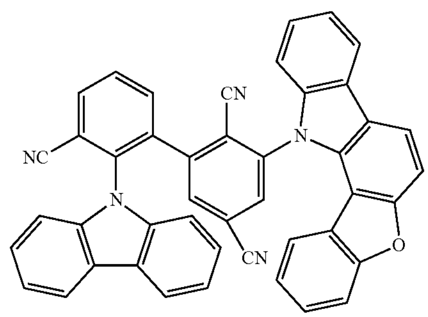
399
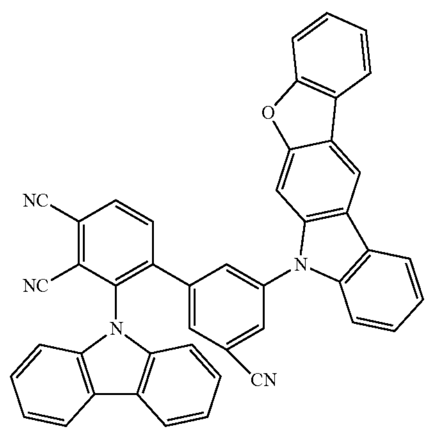
-continued
400
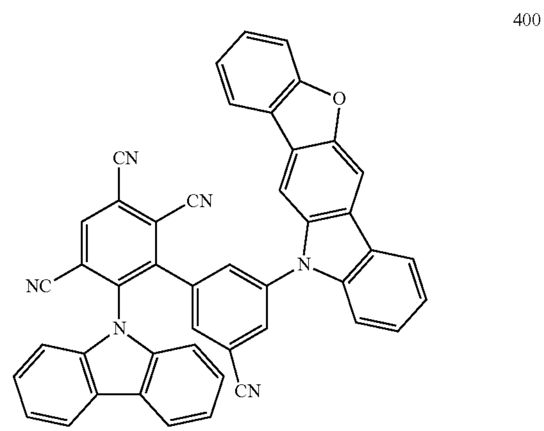
401
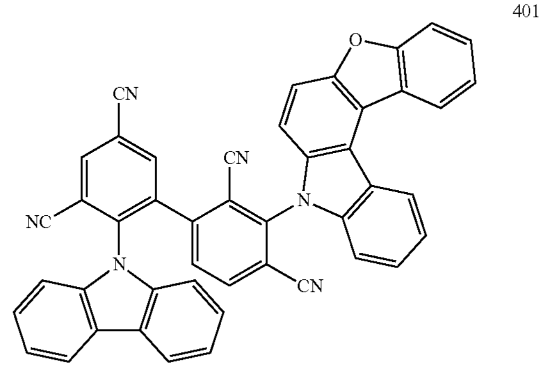
402
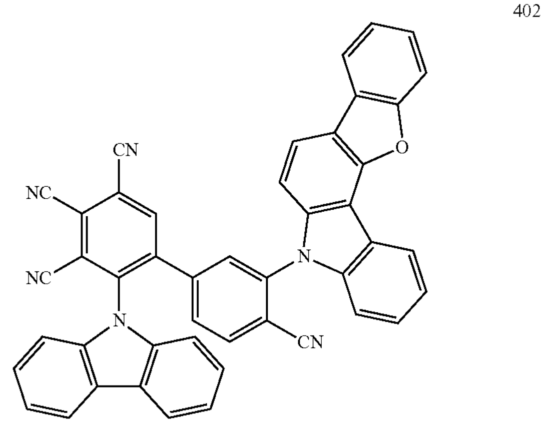
403
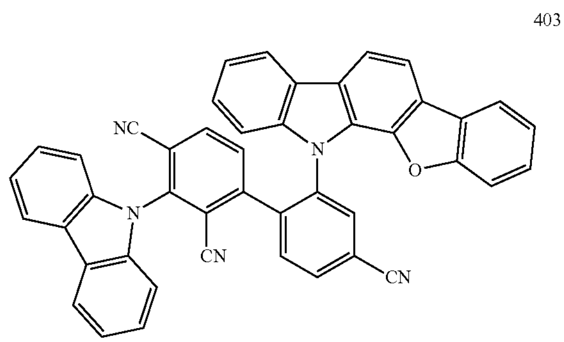

404
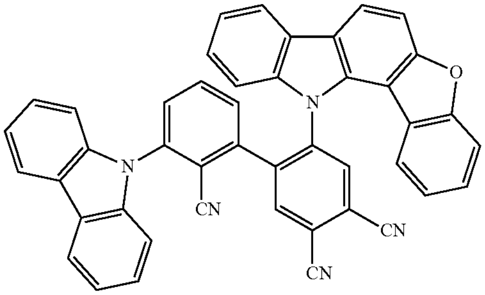
405
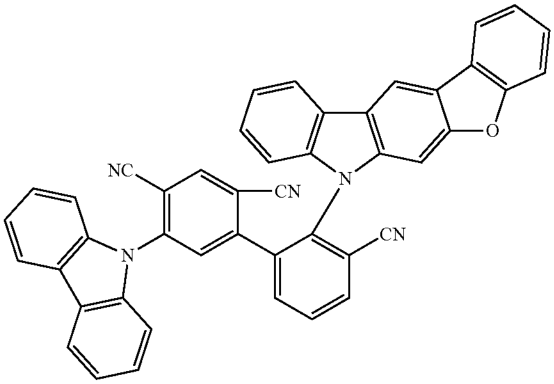
406
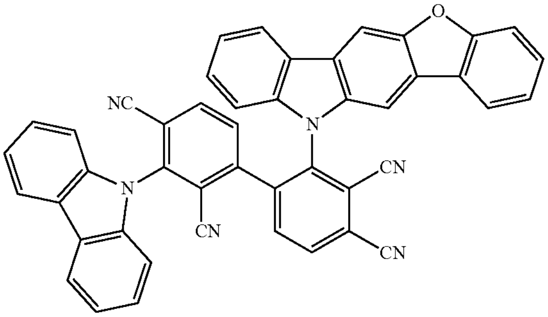
407
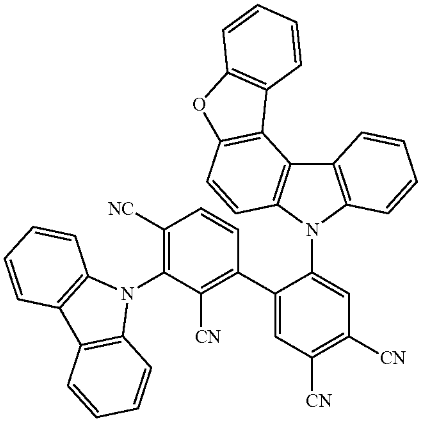
408
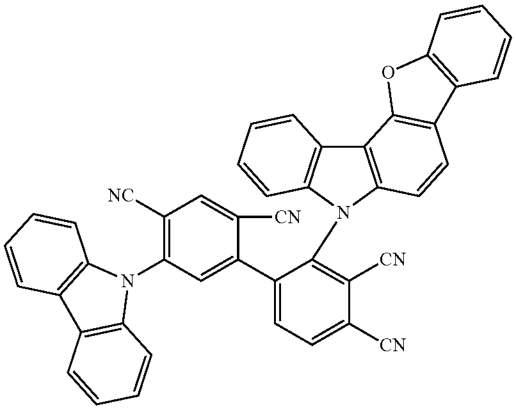
409
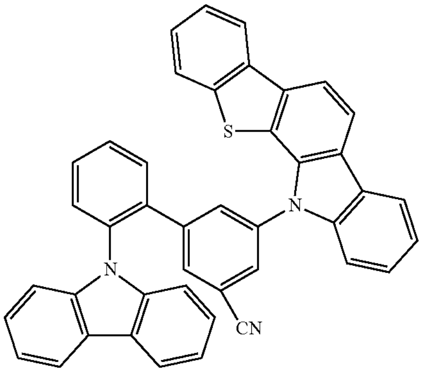
410
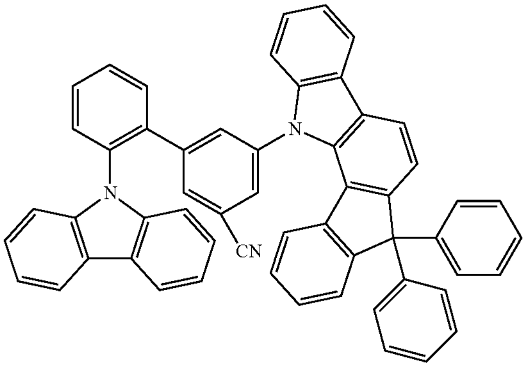
411
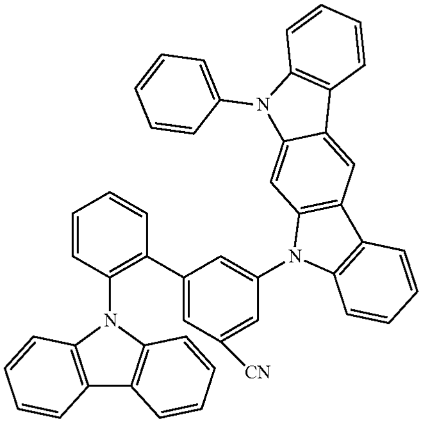

-continued
412
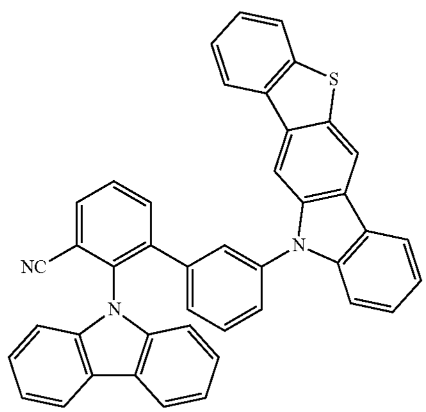
413
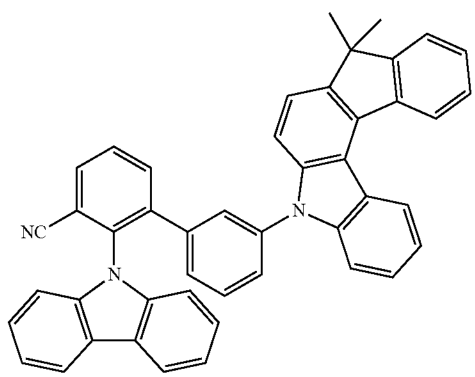
414
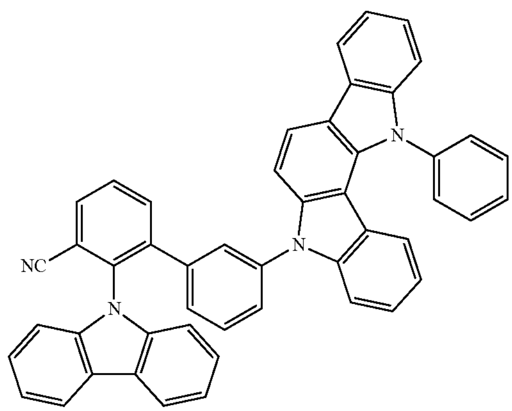
415
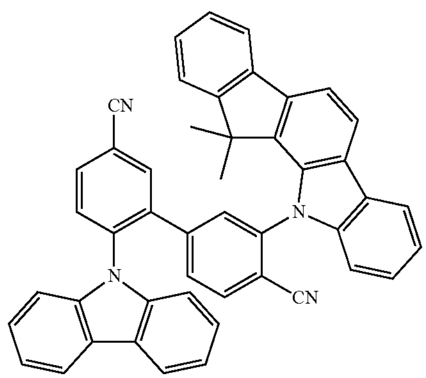
-continued
416
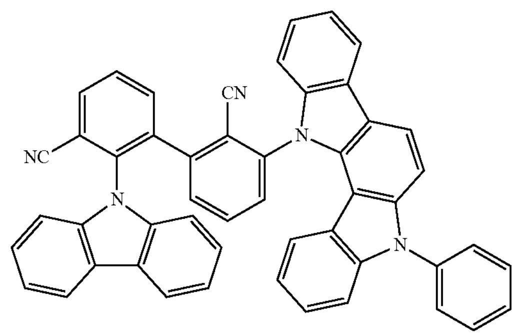
417
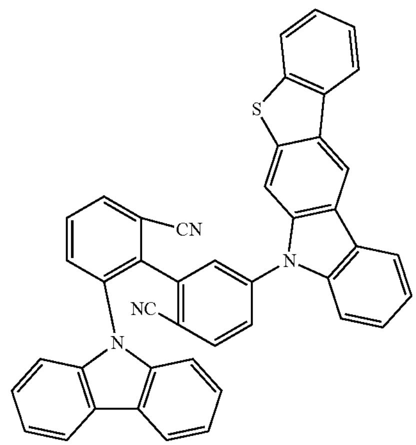
418
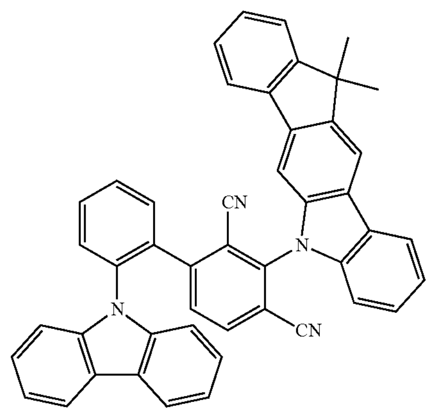
419
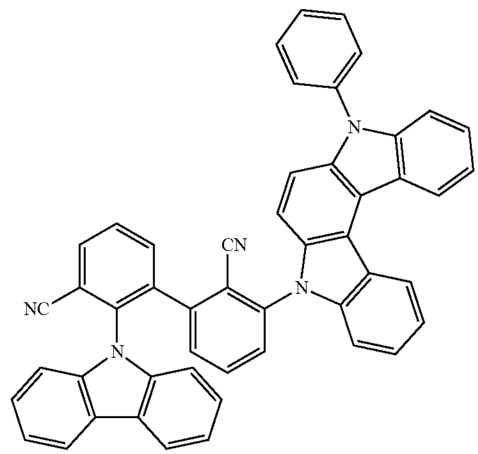

-continued
420
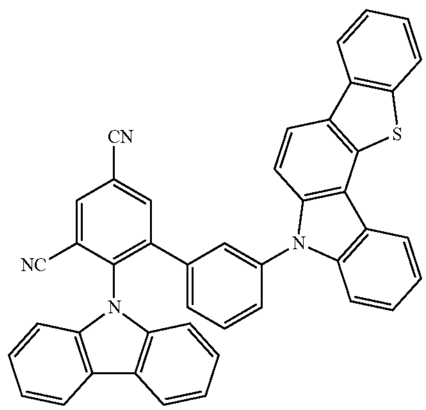
421
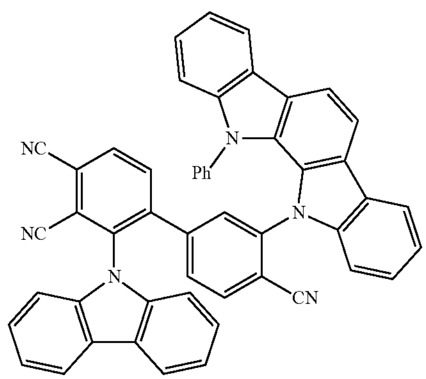
422
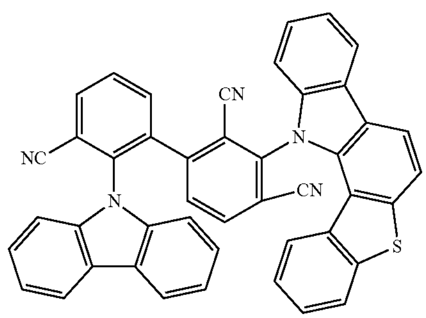
423
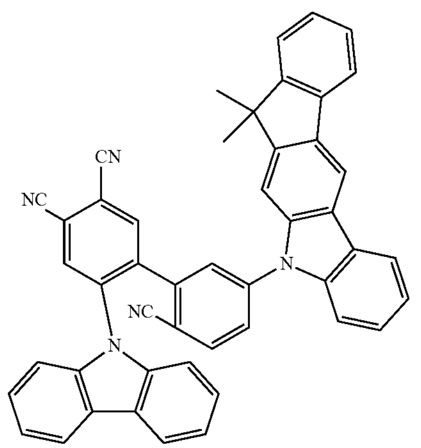
-continued
424
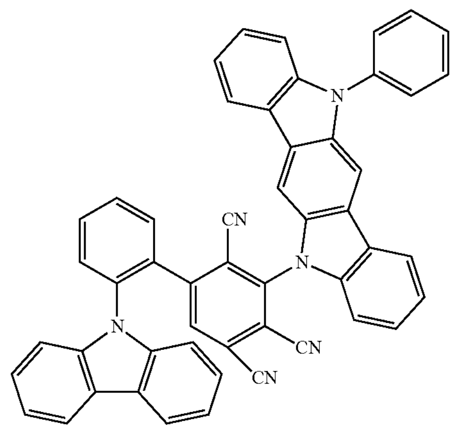
425
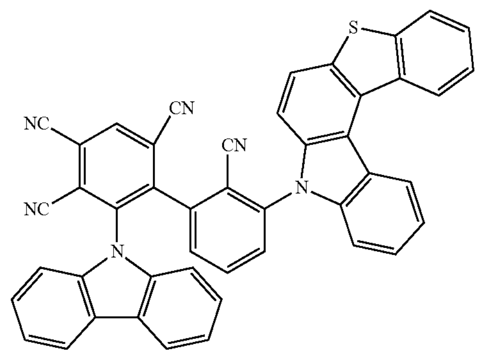
426
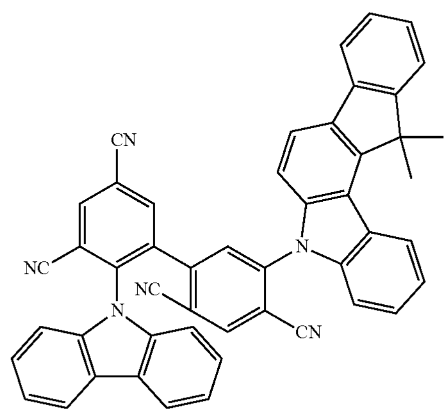
427
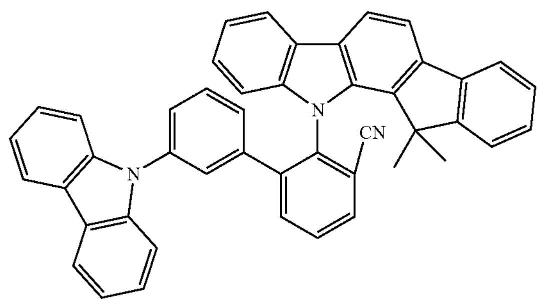

428
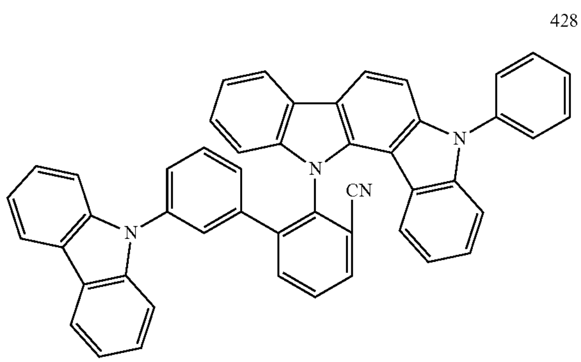
429
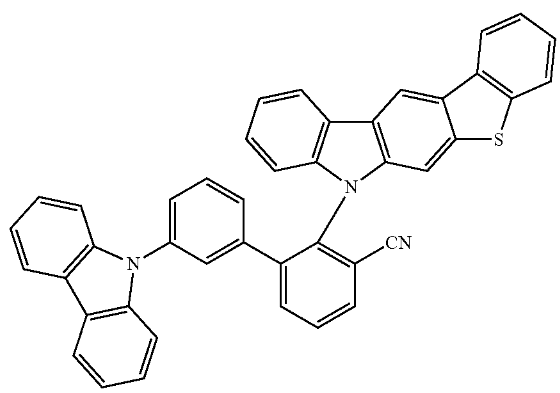
430
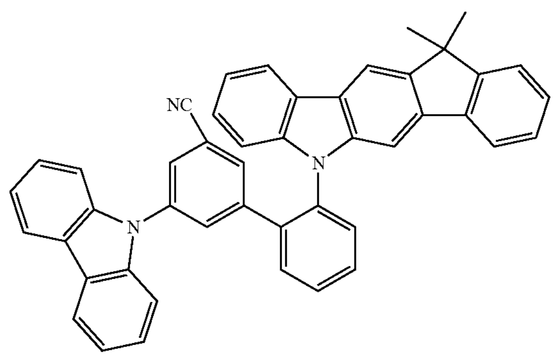
431
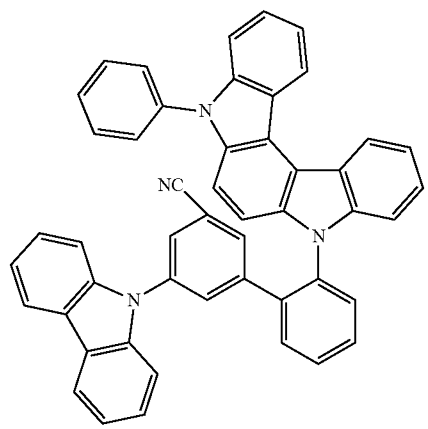
432
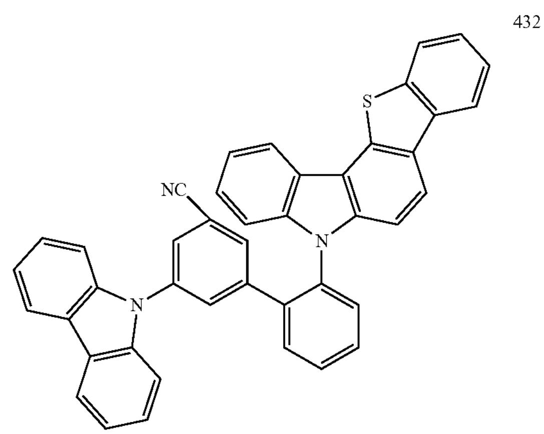
433
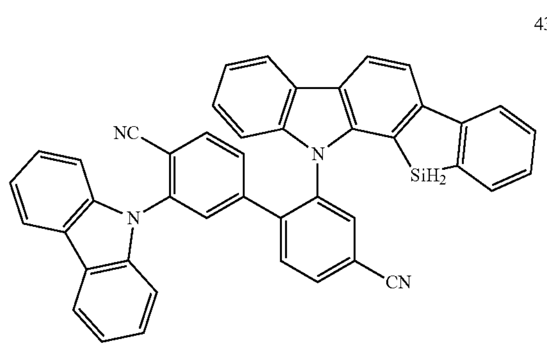
434
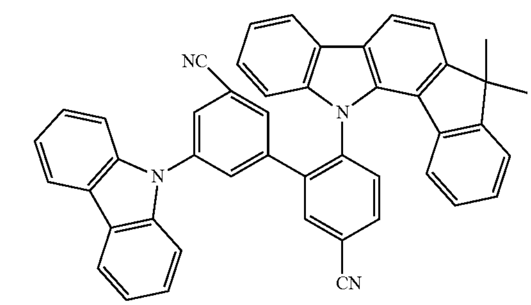
435
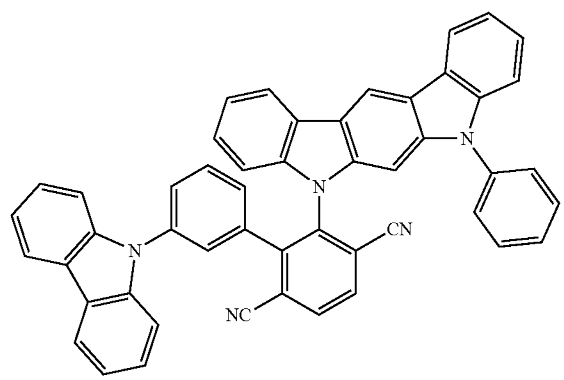

-continued
436
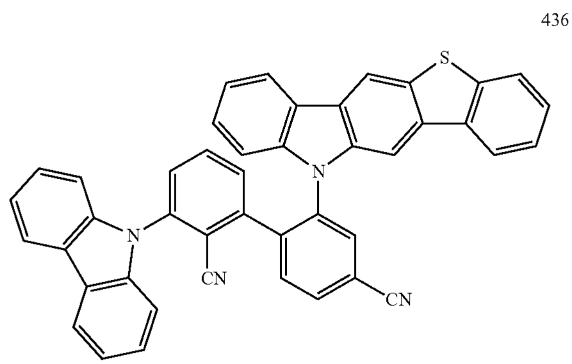
437
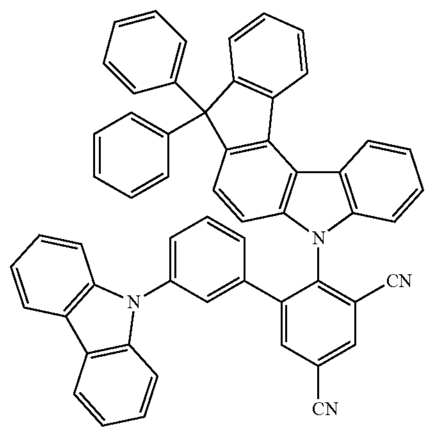
438
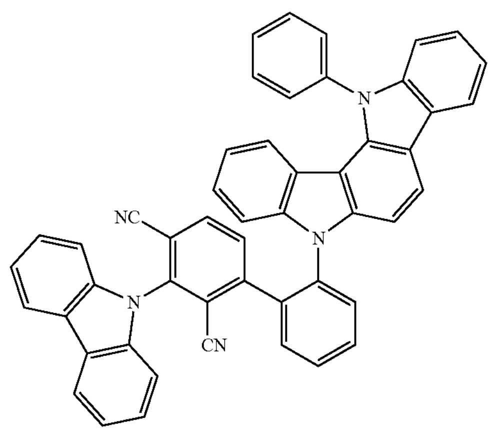
439
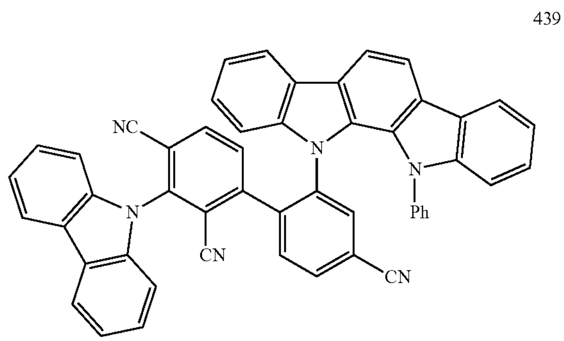
-continued
440
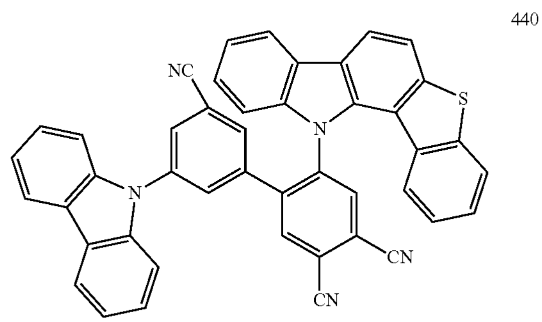
441
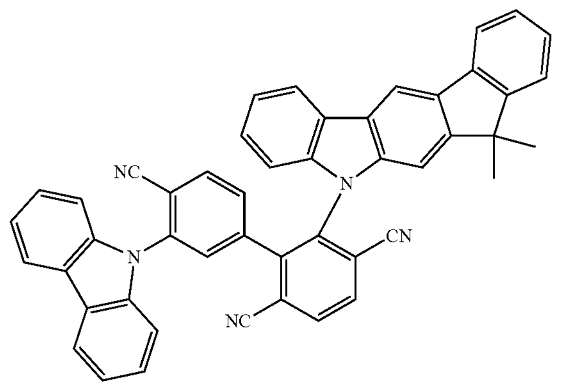
442
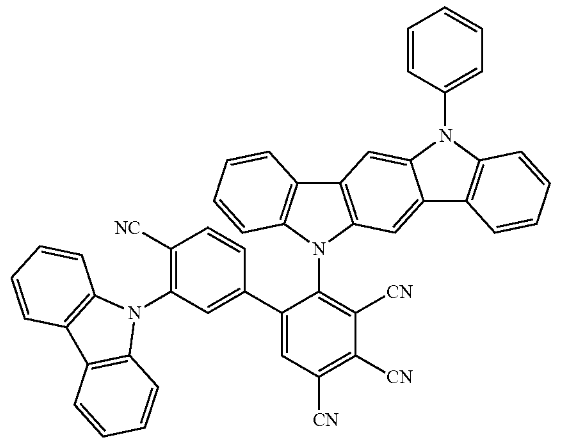
443
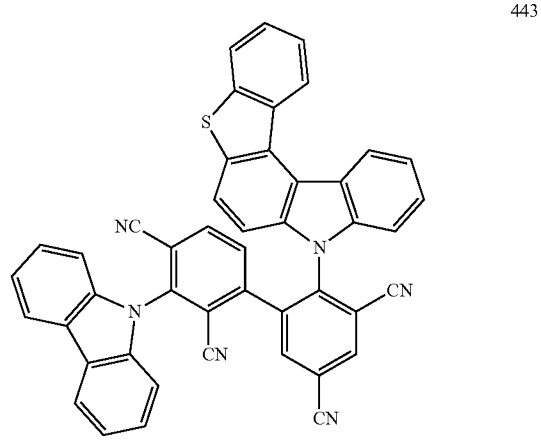

-continued
444
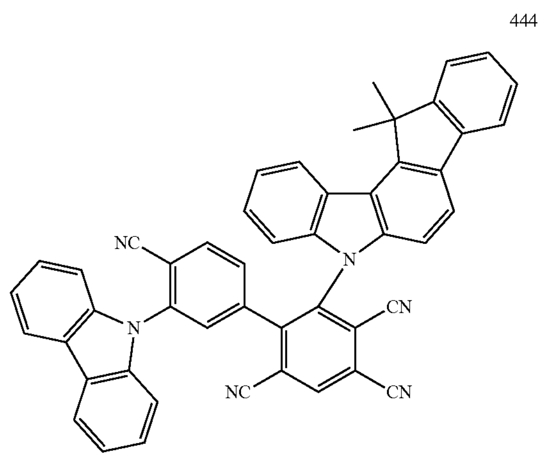
445
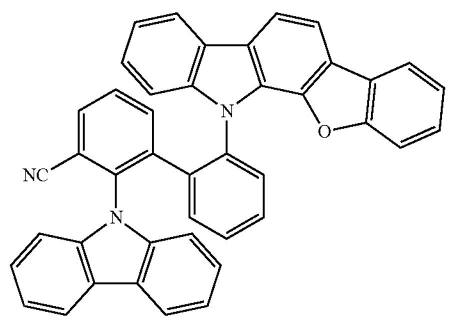
446
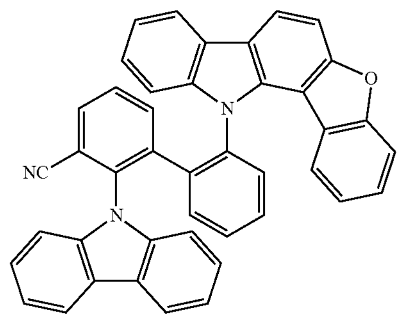
447
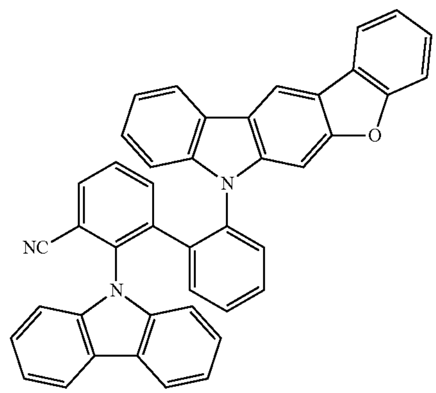
-continued
448
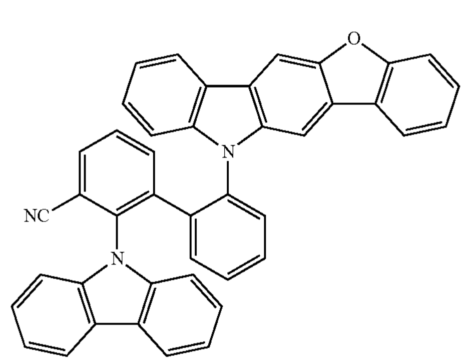
449
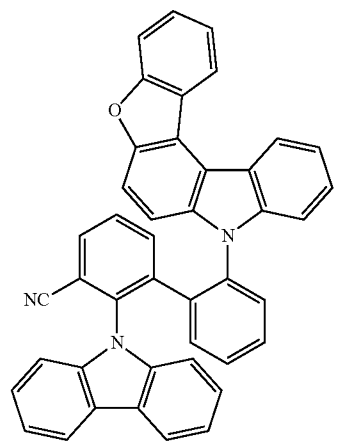
450
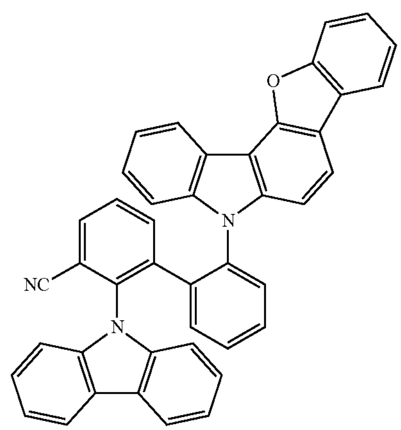
451
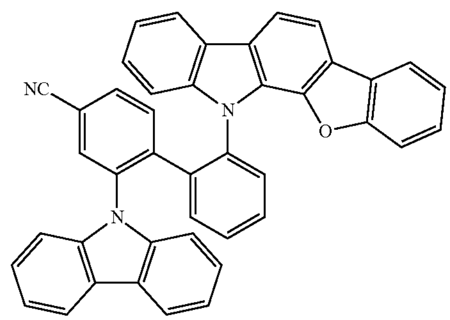

-continued
452
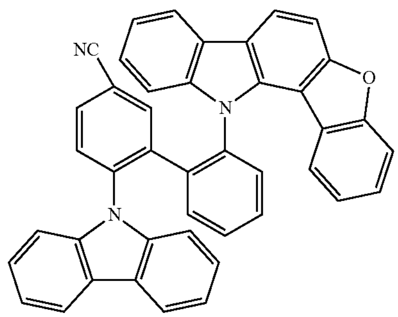
453
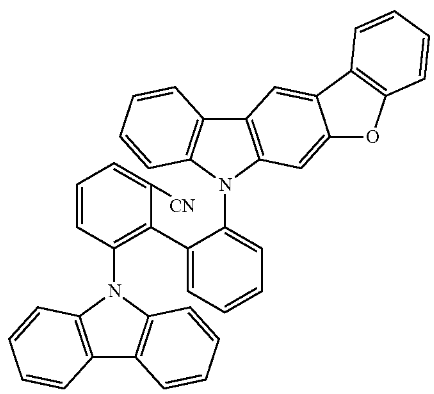
454
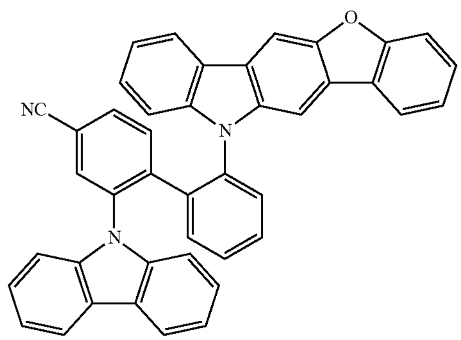
455
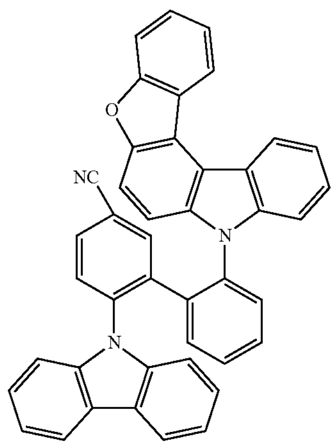
-continued
456
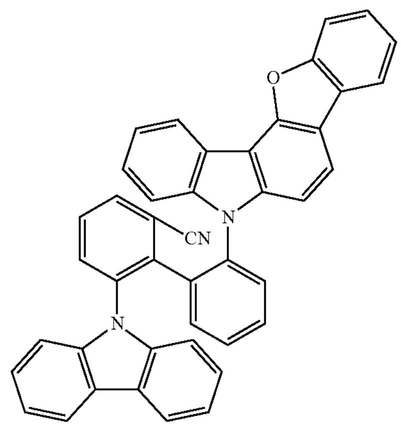
457
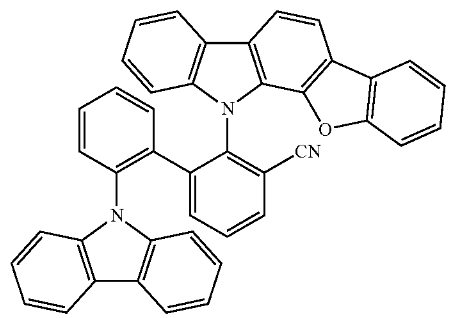
458
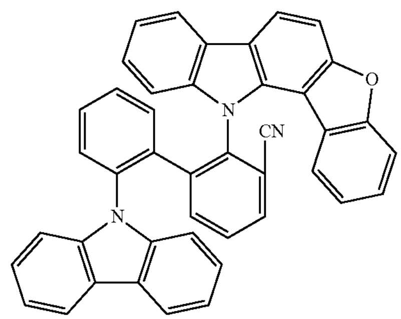
459
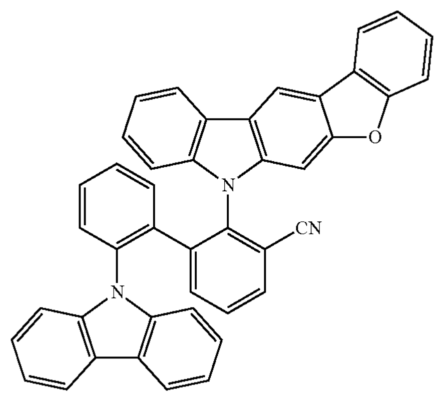

-continued
460
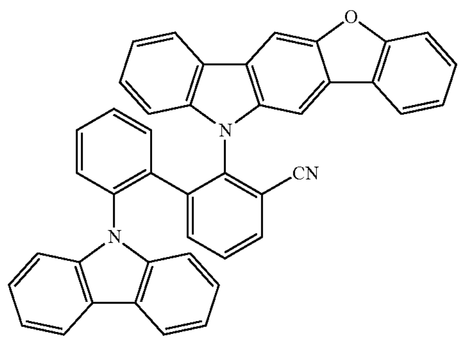
461
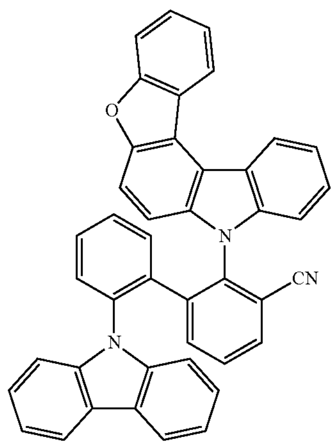
462
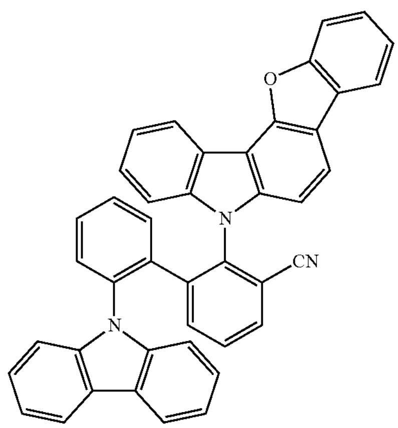
463
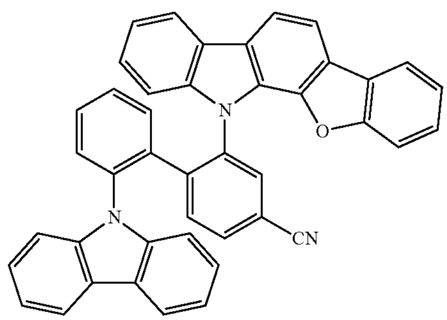
-continued
464
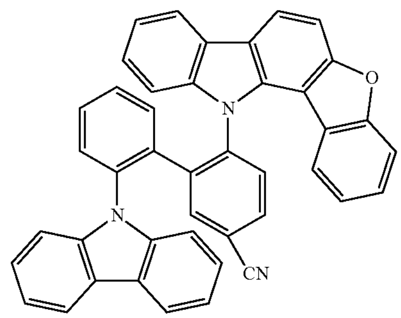
465
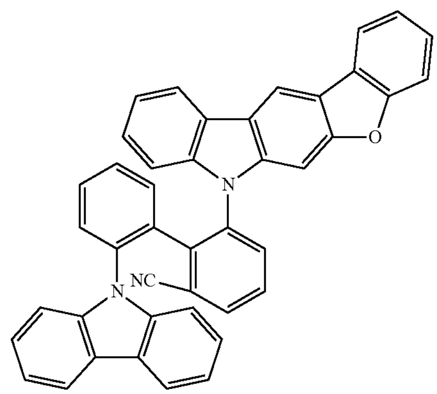
466
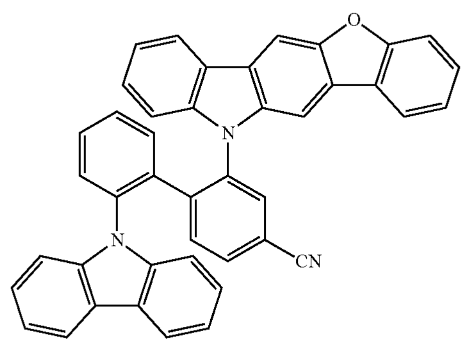
467
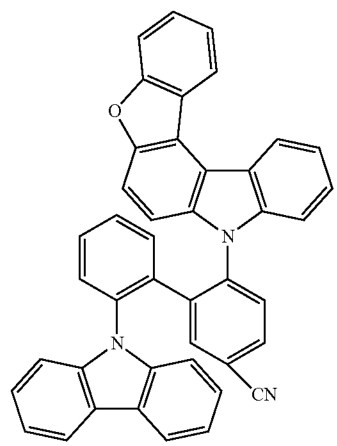

-continued
468
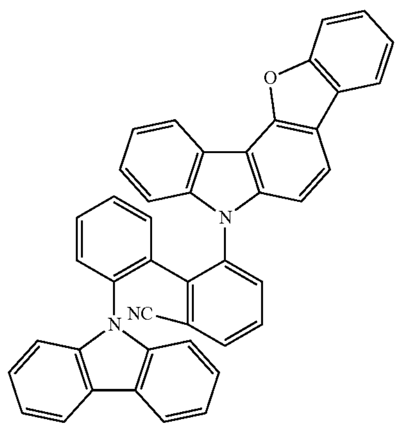
469
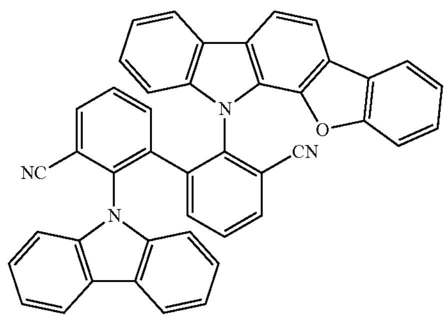
470
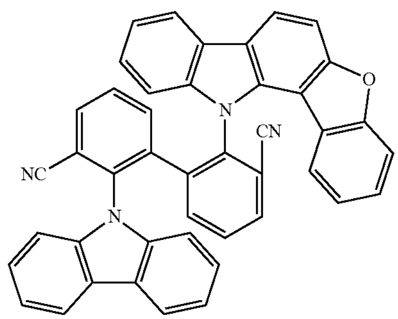
471
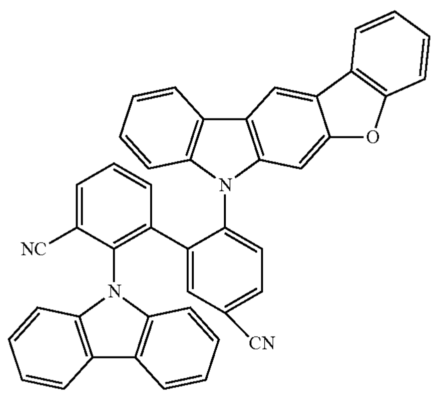
-continued
472
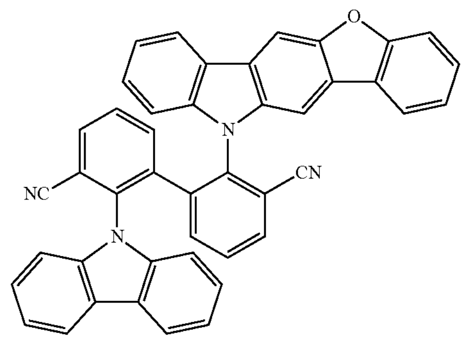
473
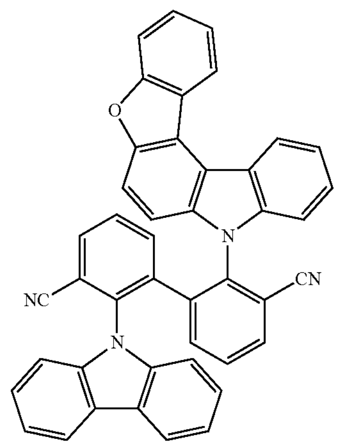
474
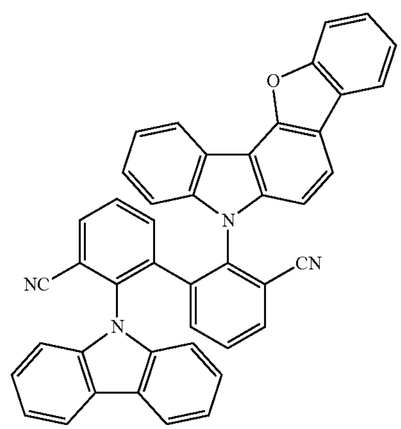
475
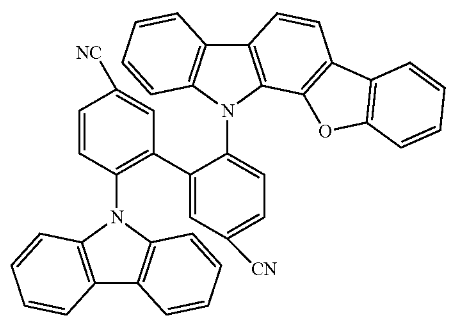

476
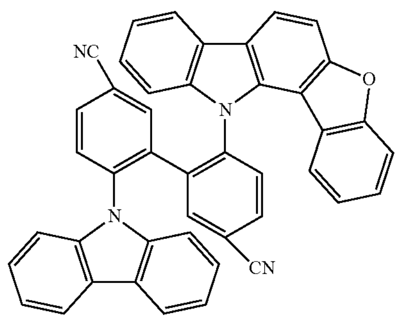
477
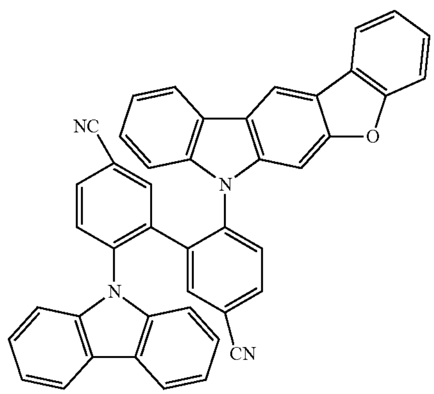
478
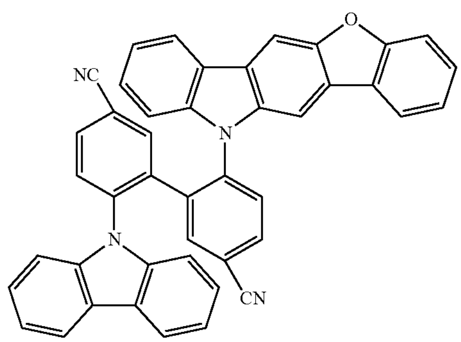
479
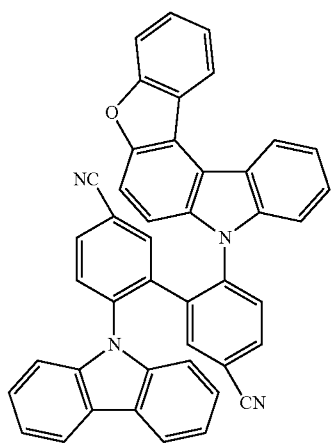
480
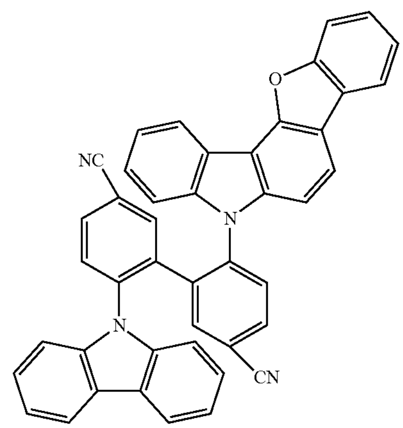
481
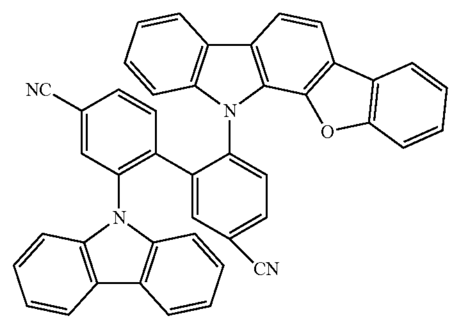
482
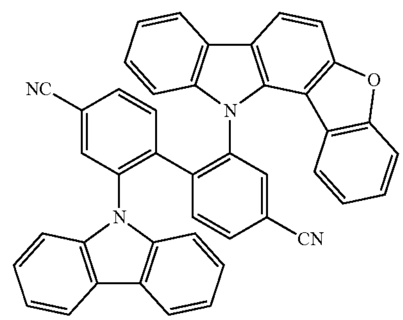
483
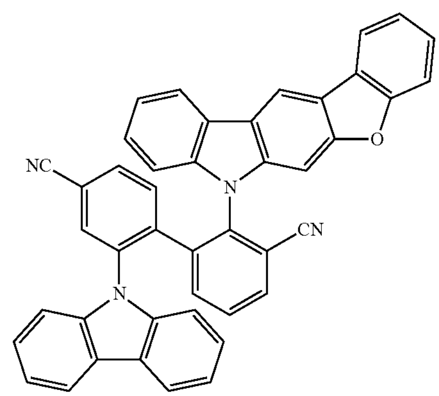

-continued
484
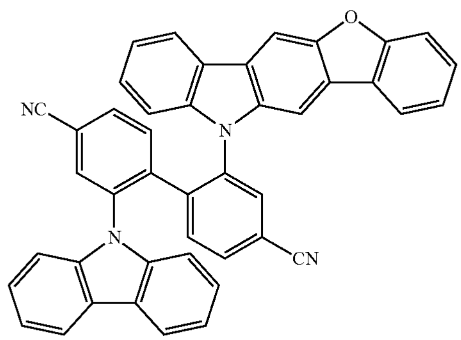
485
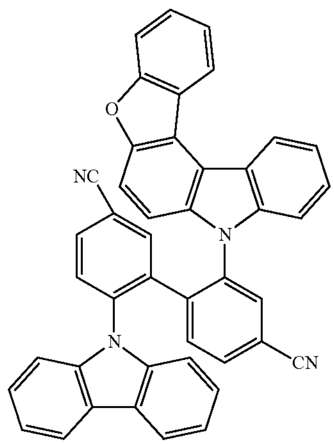
486
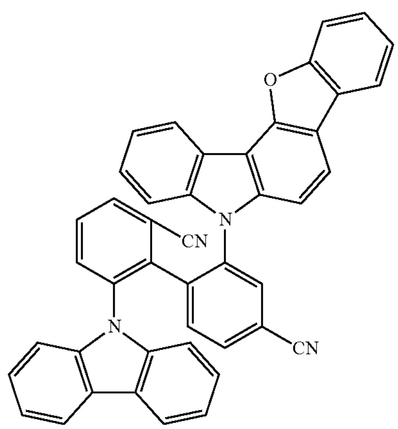
487
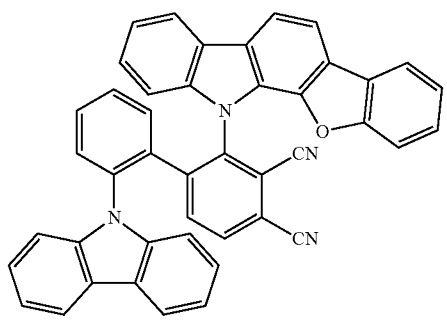
-continued
488
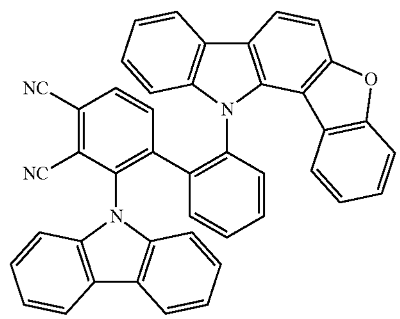
489
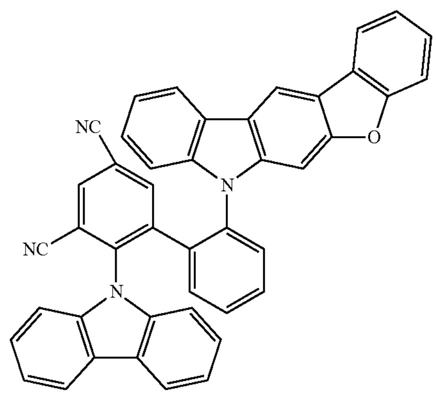
490
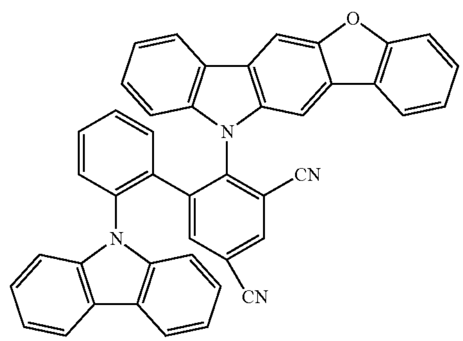
491
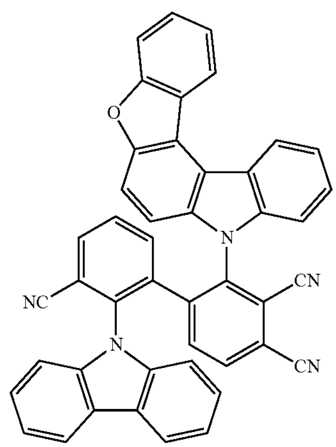

-continued
492
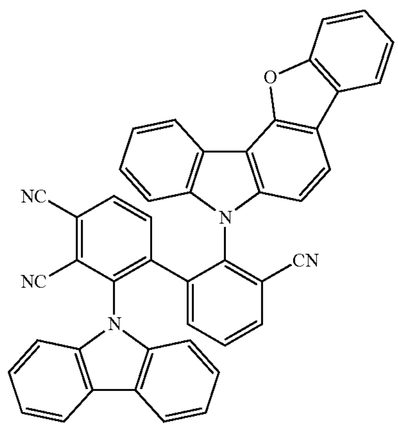
493
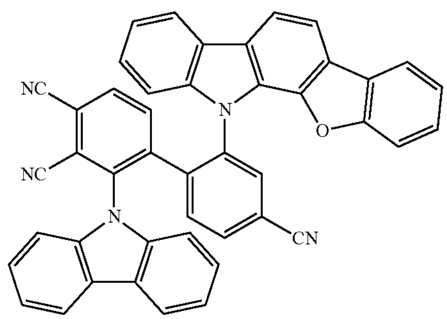
494
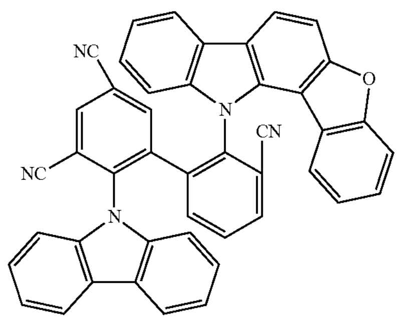
495
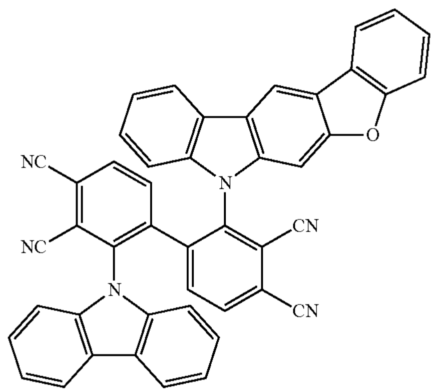
-continued
496
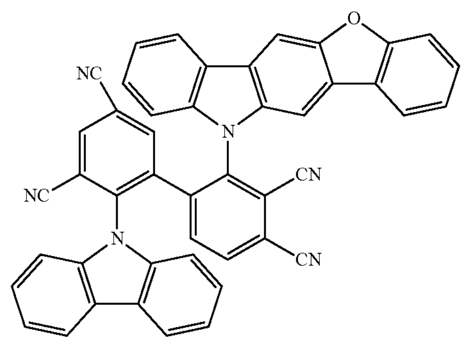
497
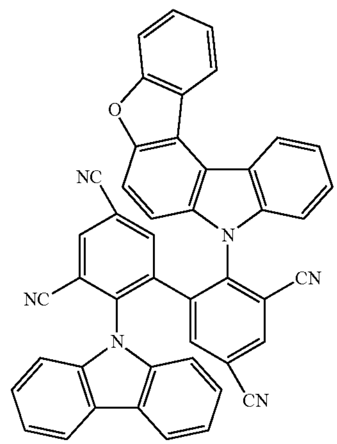
498
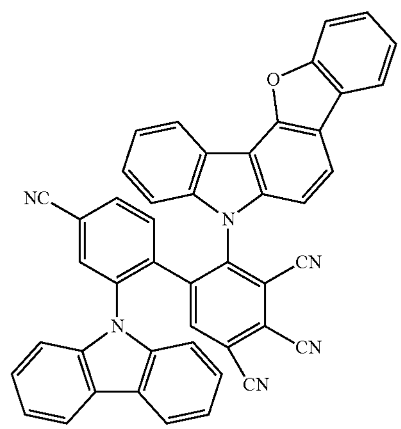
499
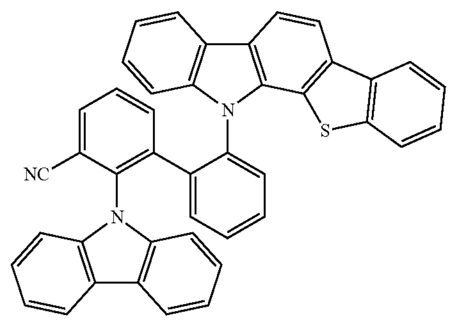

500
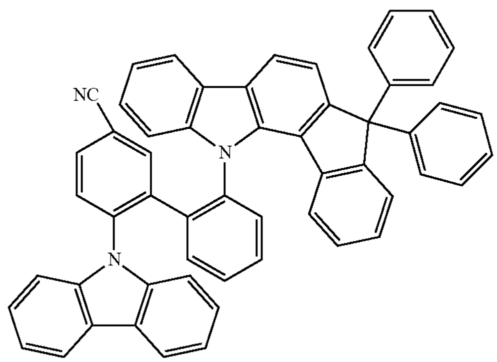
501
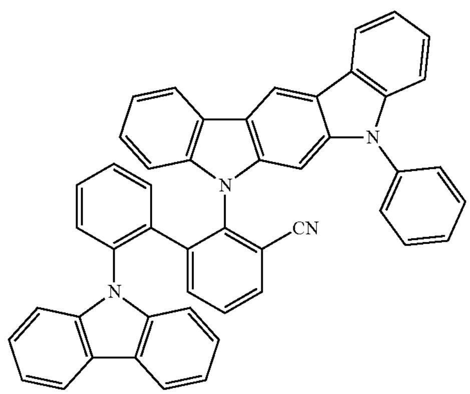
502
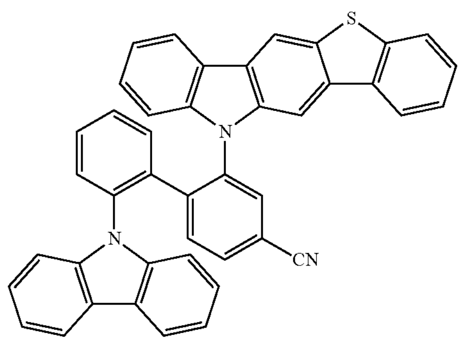
503
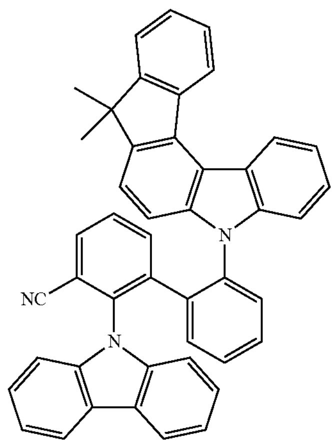
504
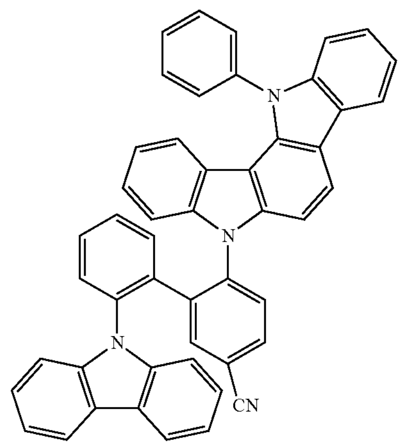
505
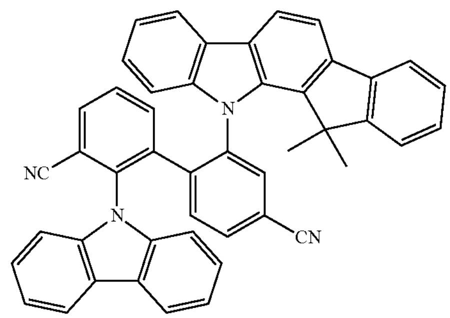
506
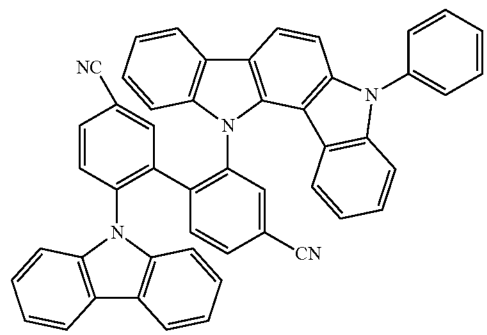
507
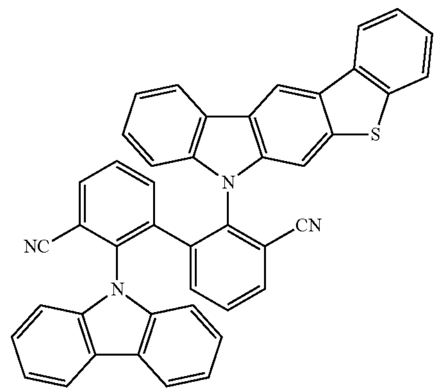

-continued
508
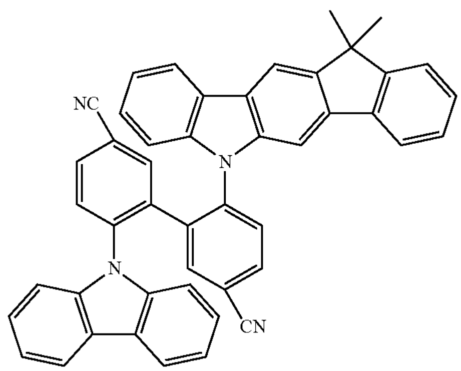
509
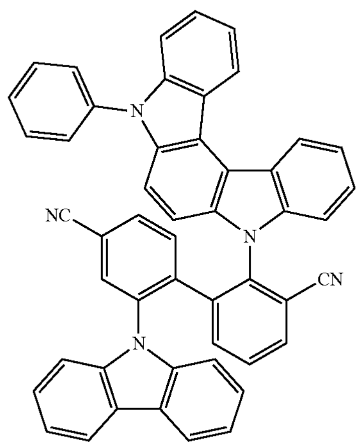
510
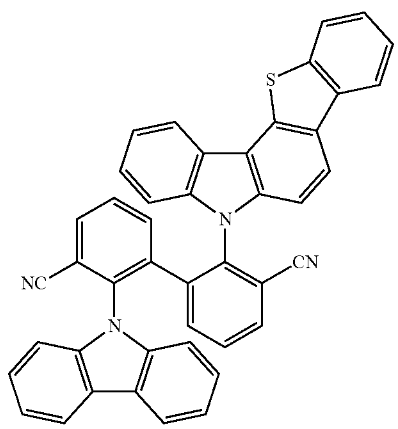
511
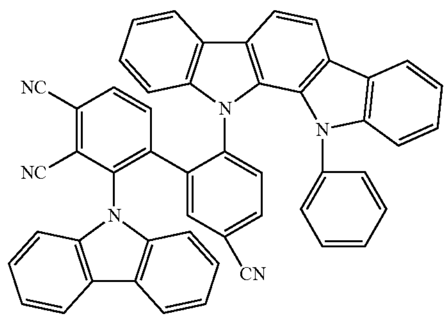
-continued
512
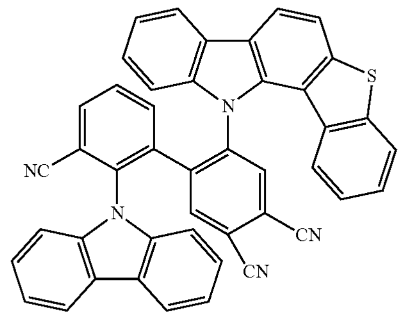
513
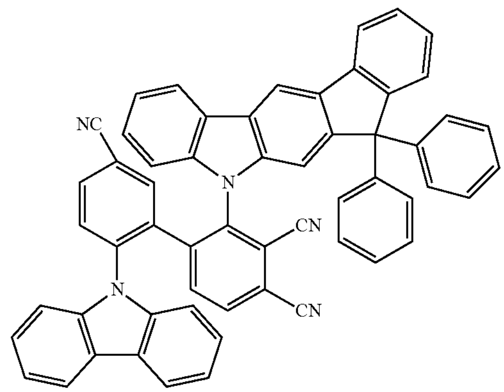
514
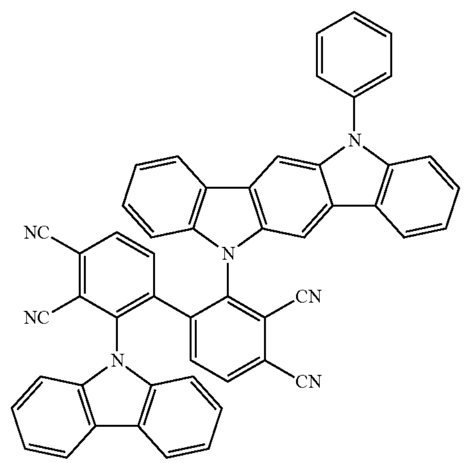
515
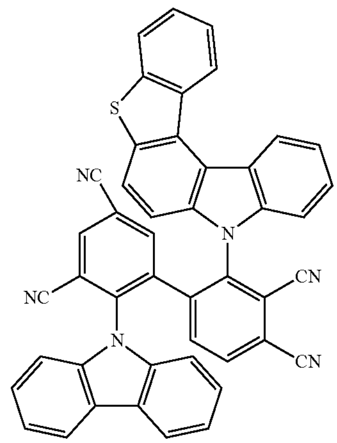

-continued
516
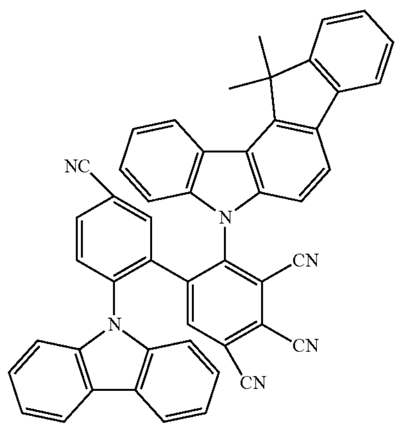
517
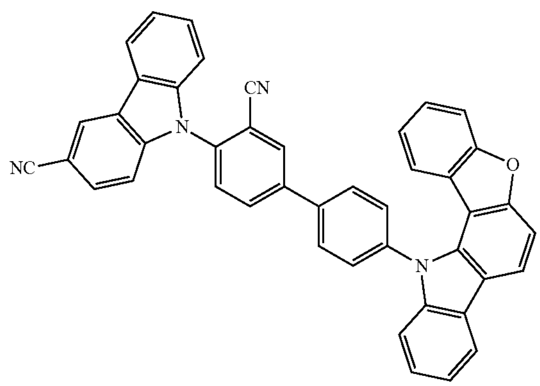
518
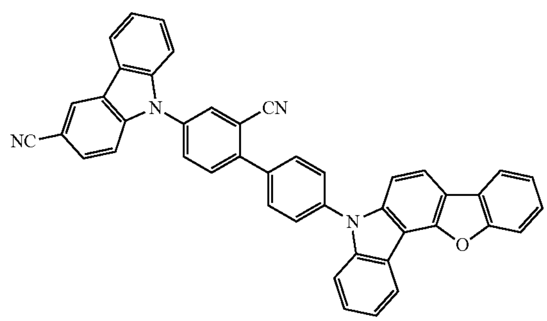
519
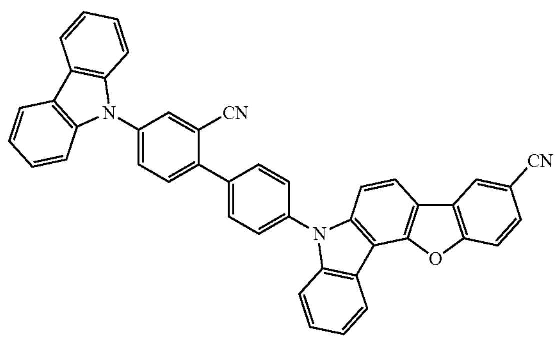
-continued
520
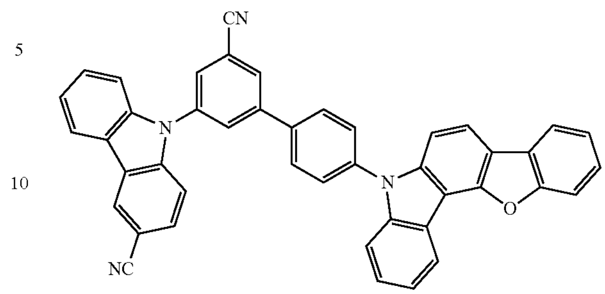
521
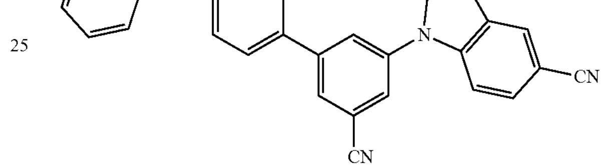
522
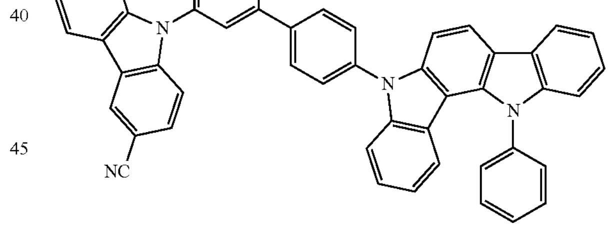
523
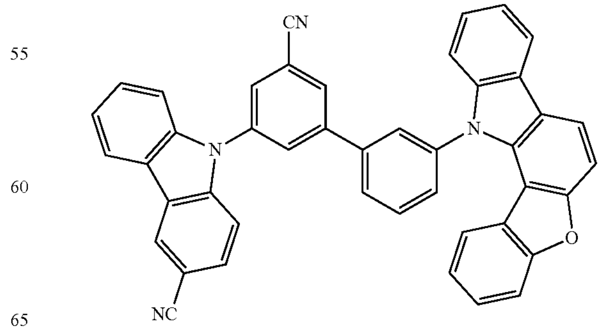

524
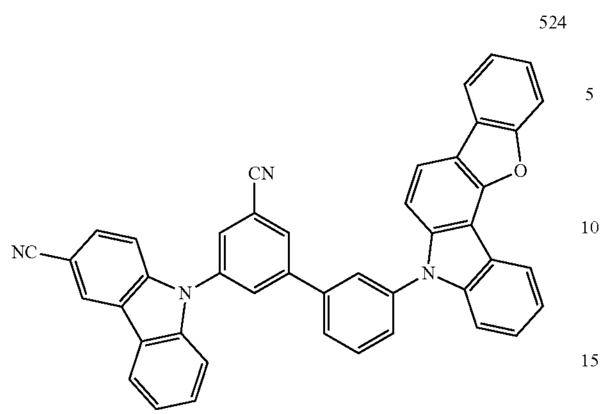
525
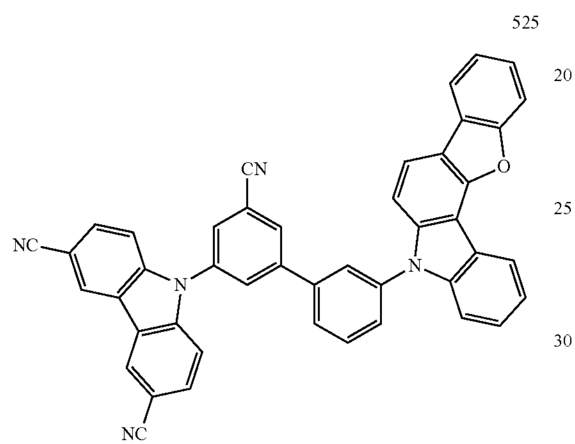
526
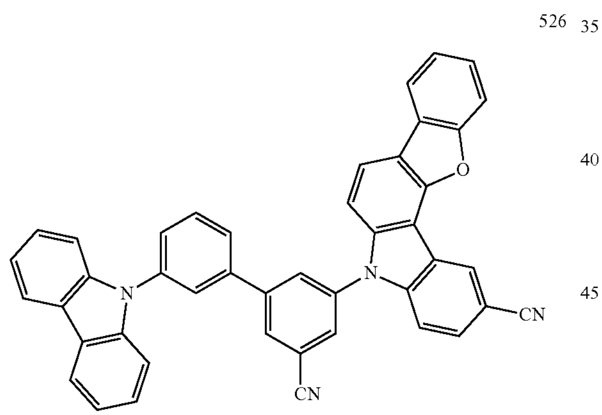
527
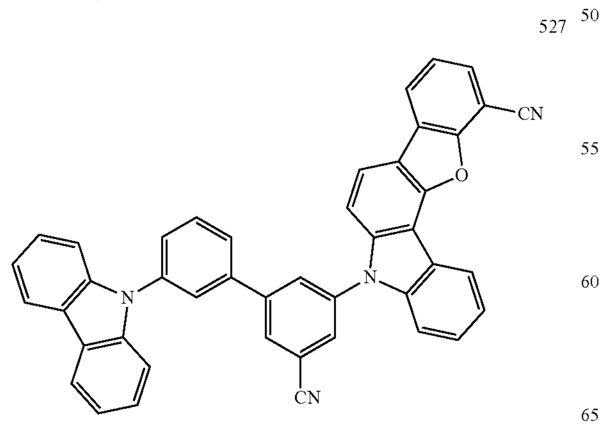
528
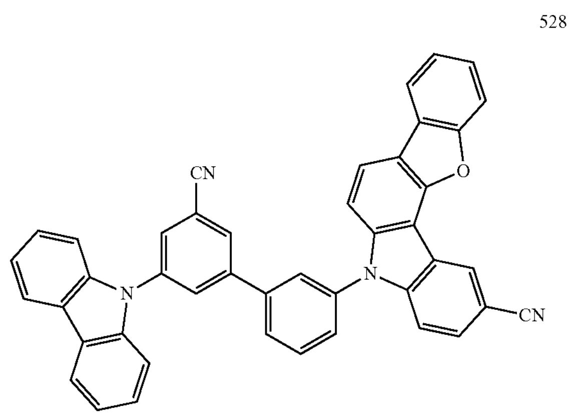
529
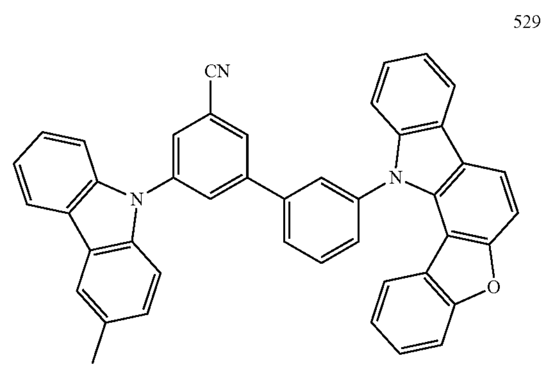
530
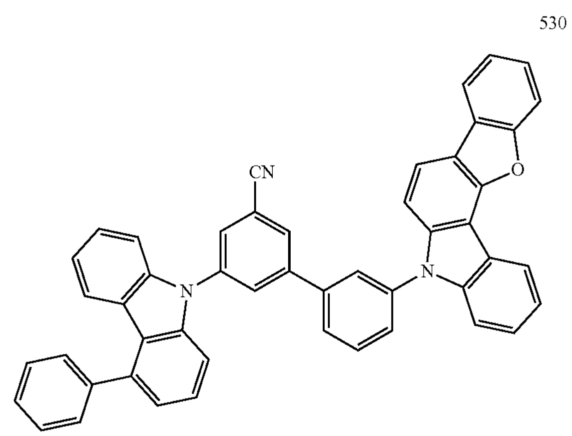
531
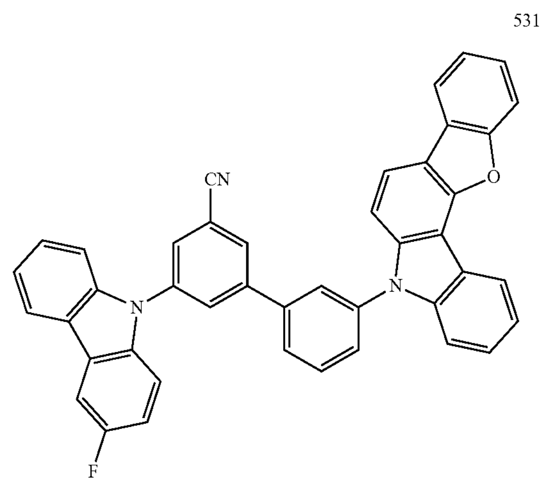

-continued
532
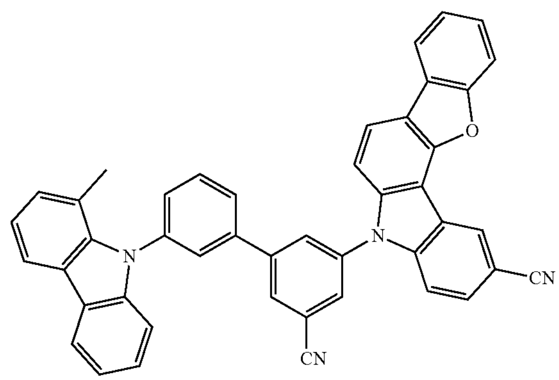
533
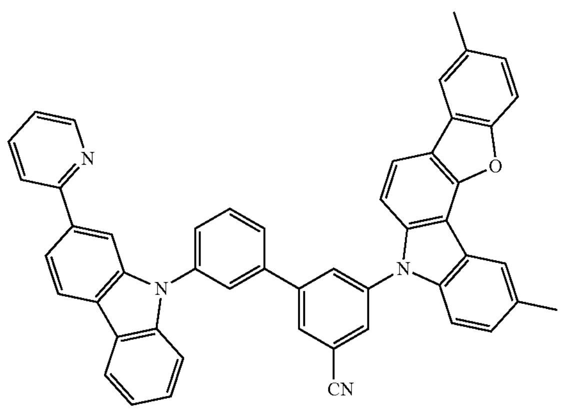
534
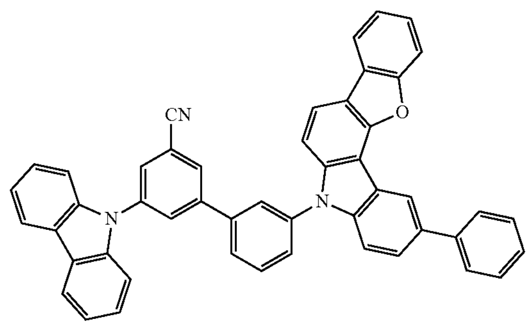
535
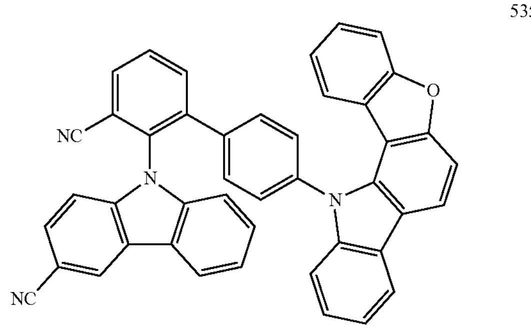
-continued
536
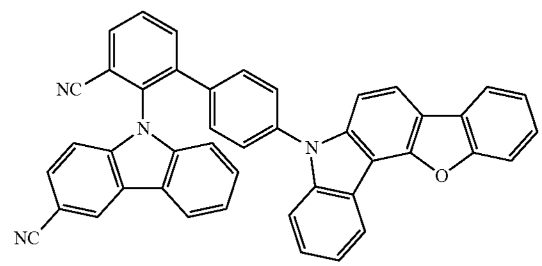
537
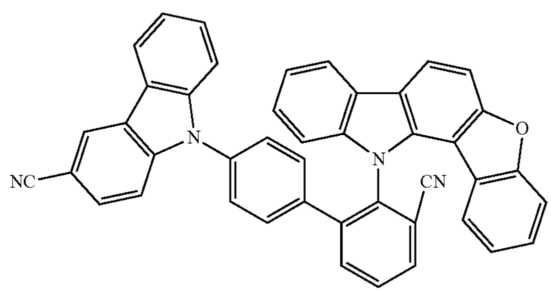
538
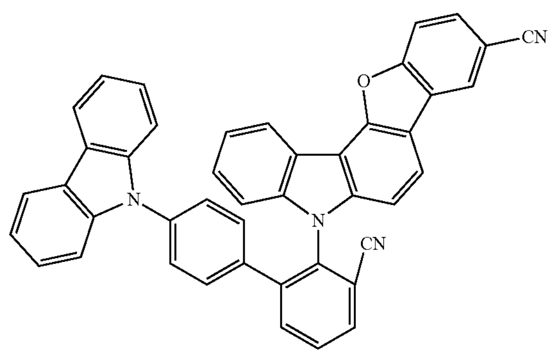
539
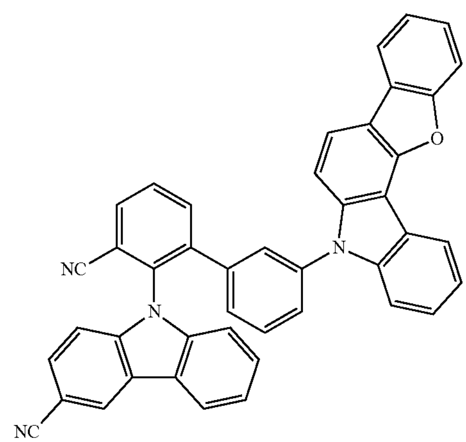

-continued
540
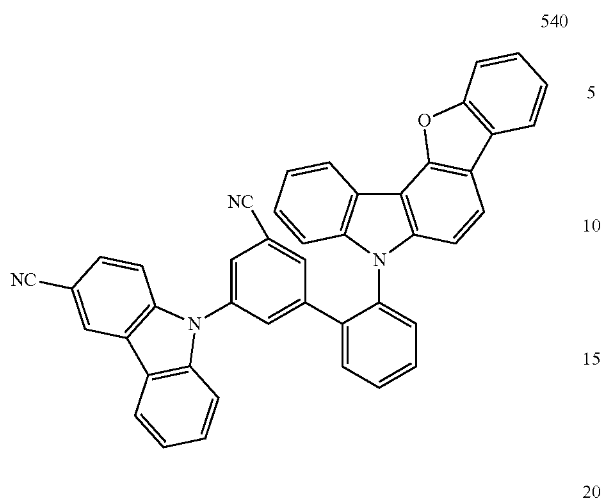
541
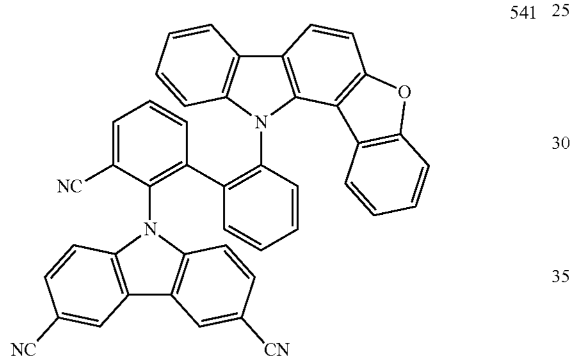
542
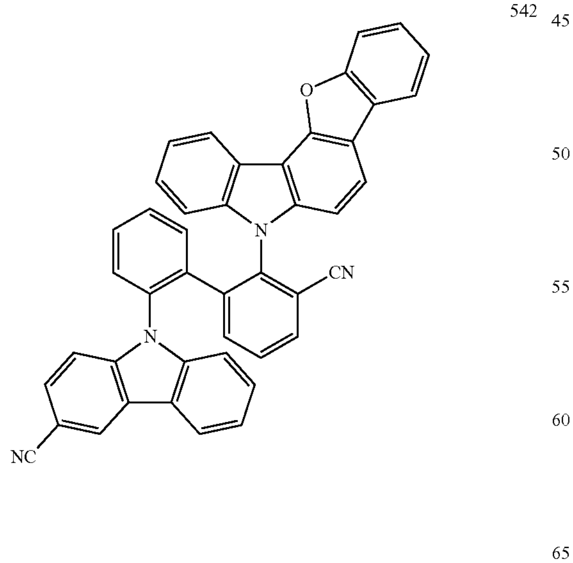
-continued
543
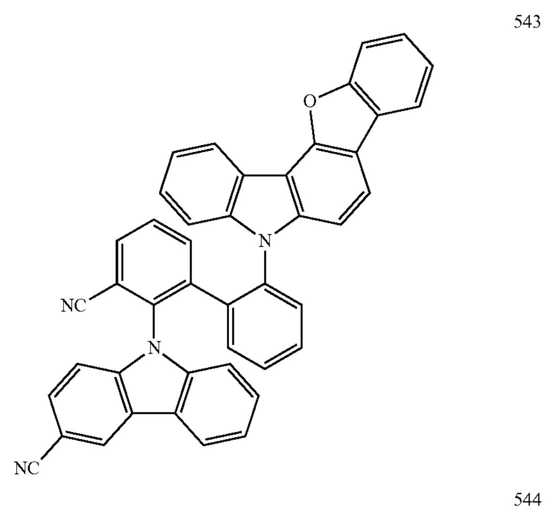
544
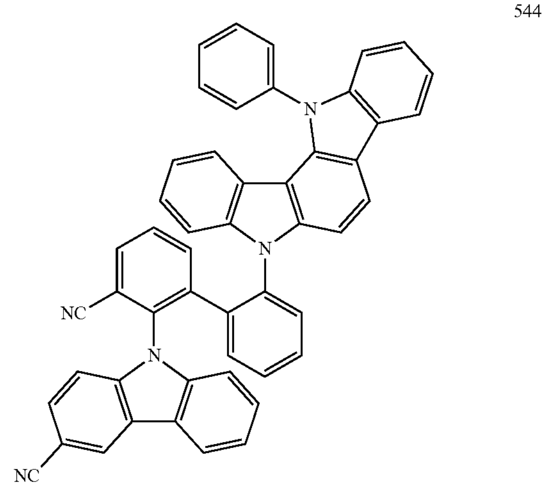
545
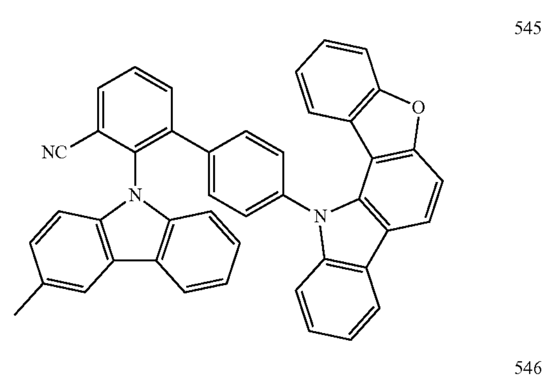
546
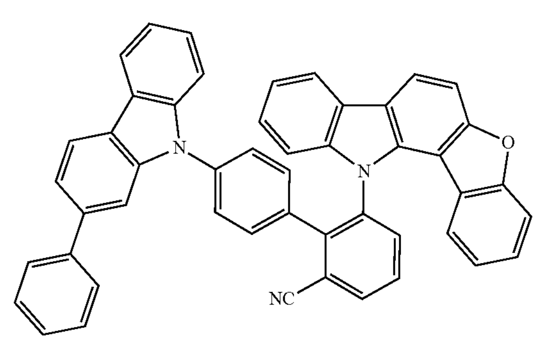

-continued
547
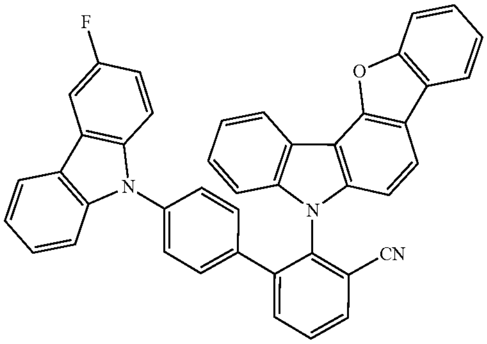
548
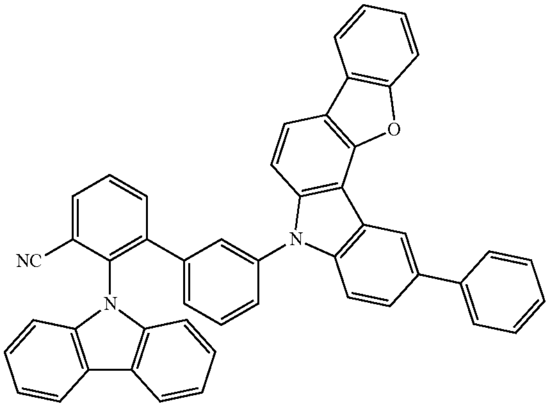
549
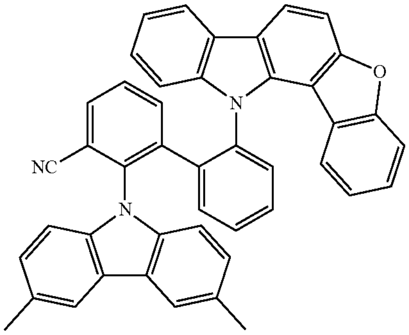
550
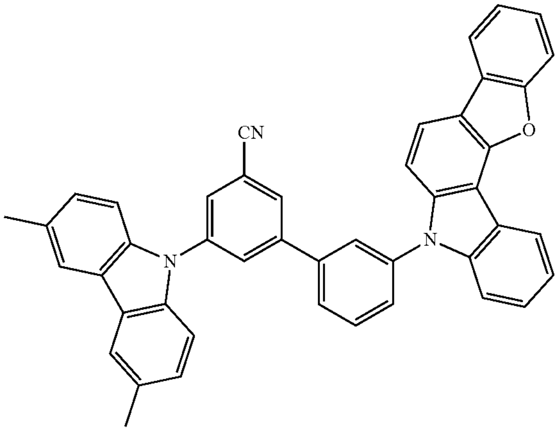
-continued
551
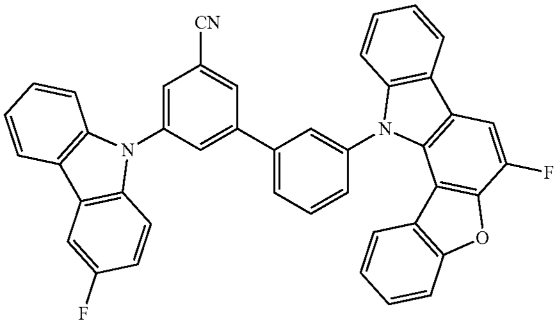
552
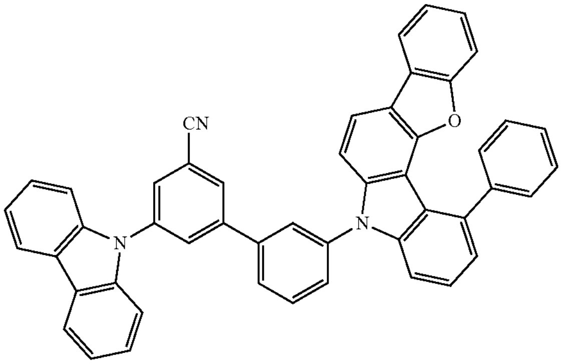
553
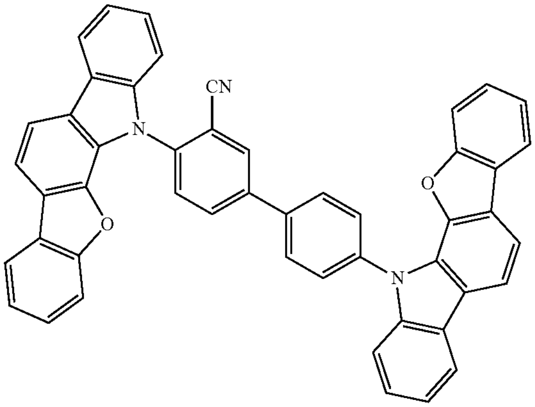
554
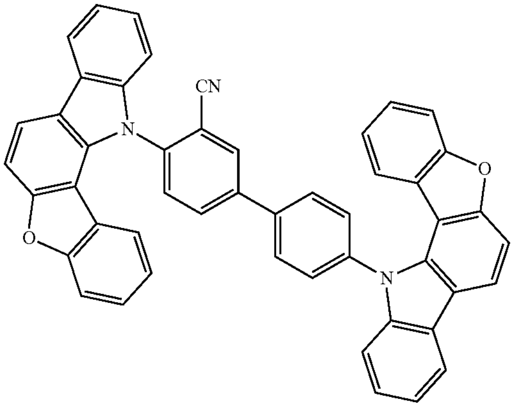

-continued
555
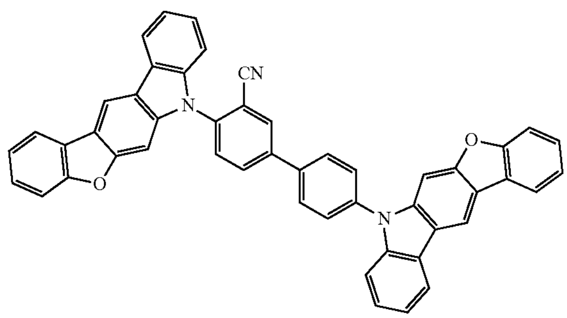
556
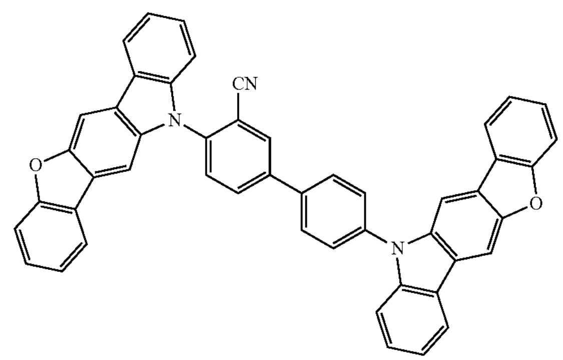
557
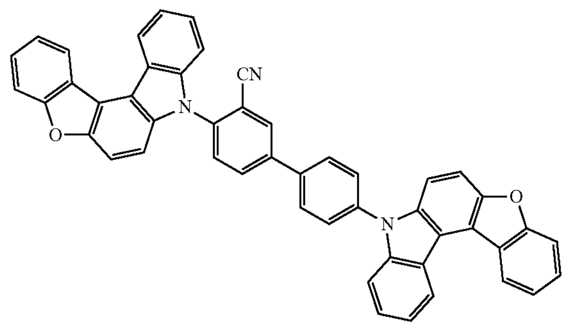
558
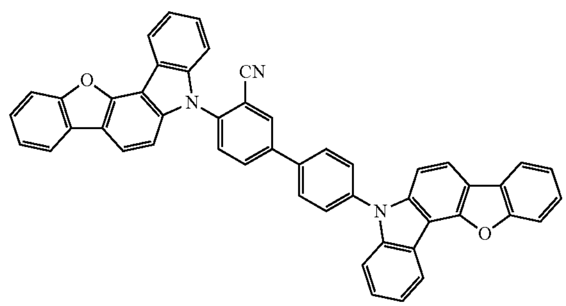
-continued
559
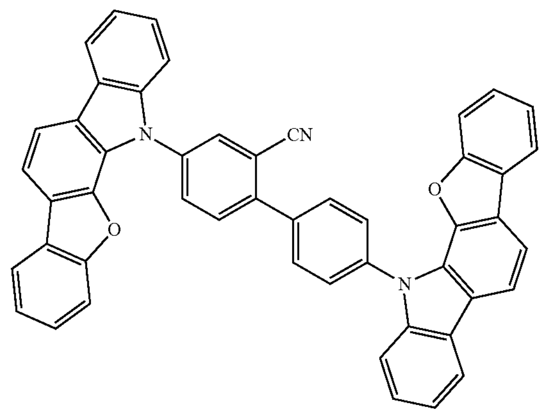
560
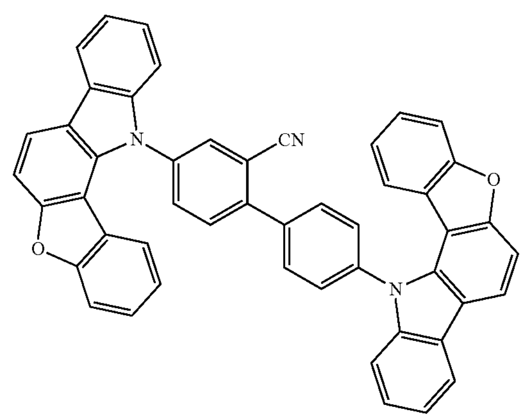
561
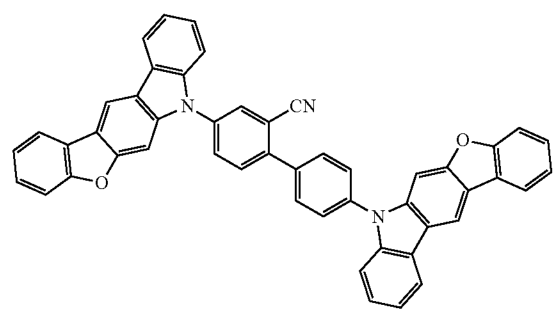
562
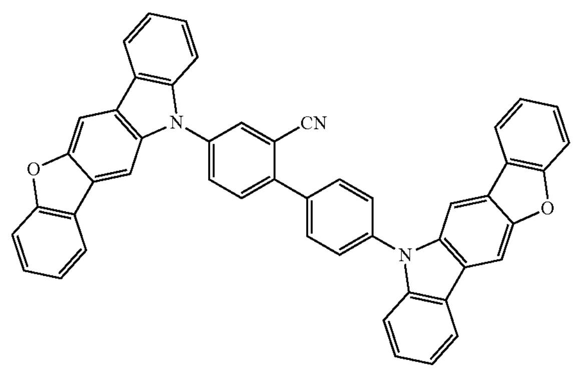

-continued
563
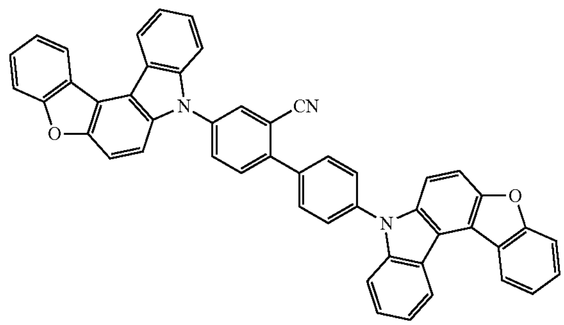
564
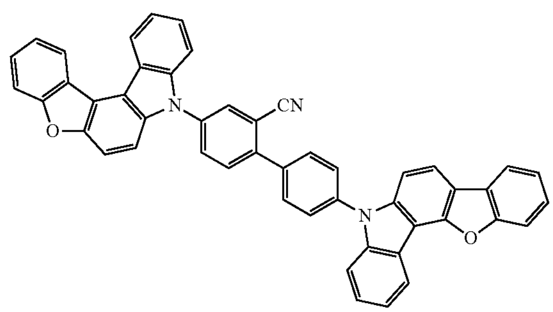
565
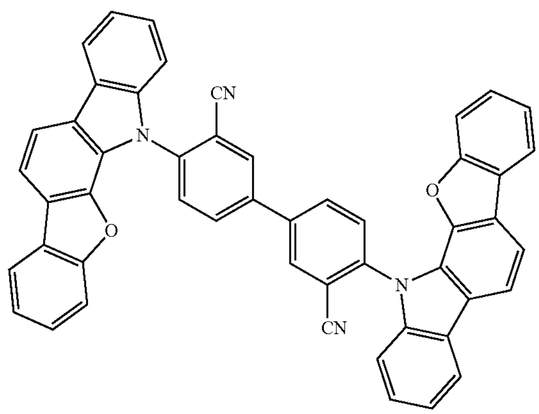
566
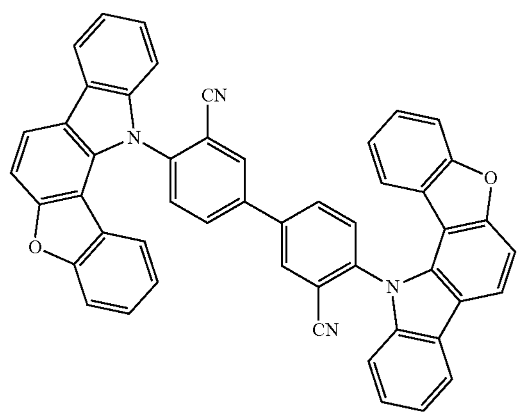
-continued
567
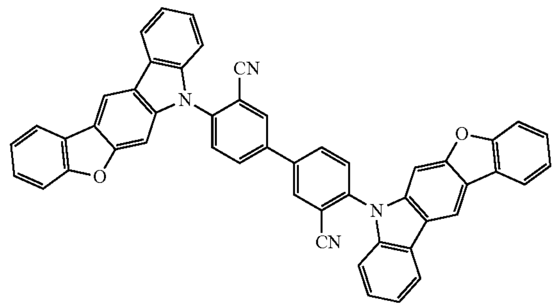
568
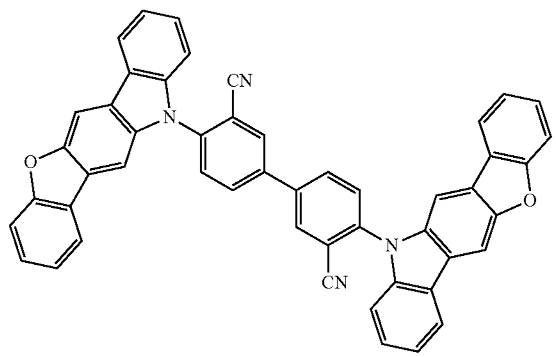
569
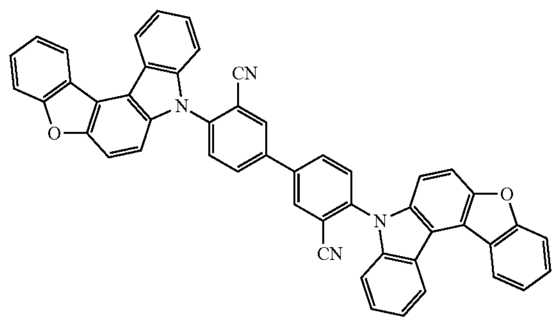
570
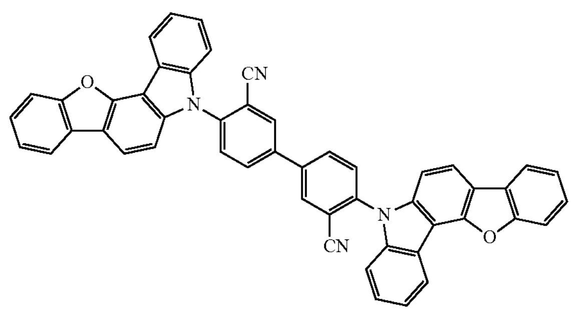

-continued
571
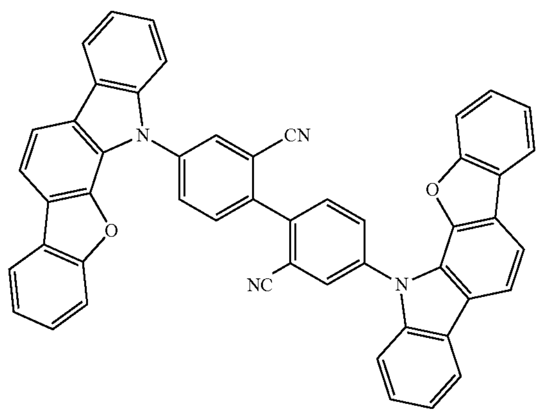
572
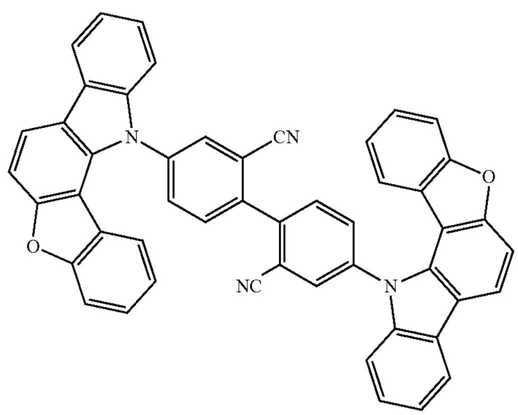
573
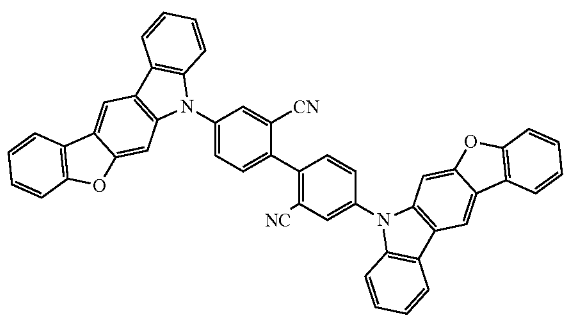
574
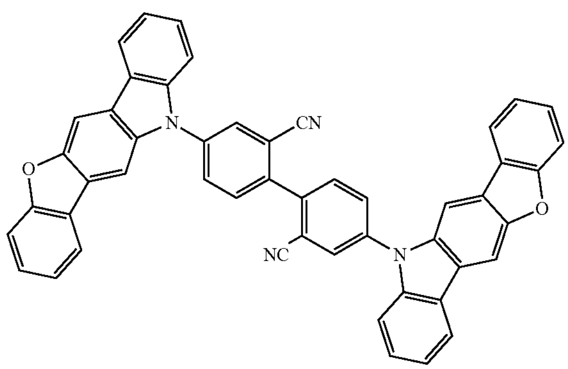
-continued
575
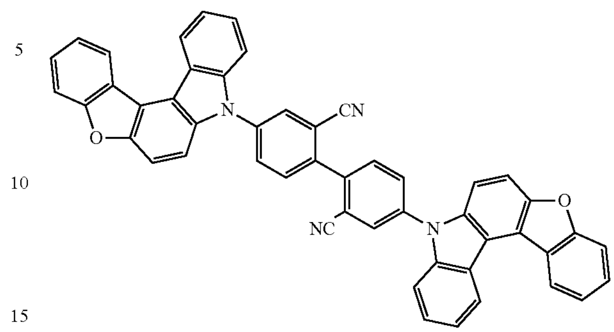
576
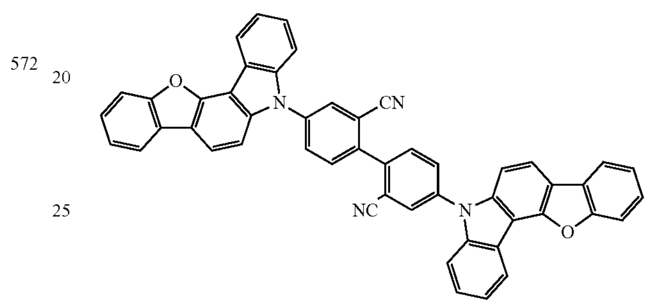
577
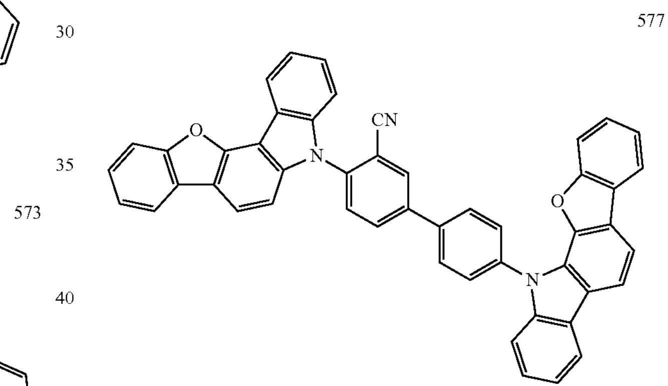
578
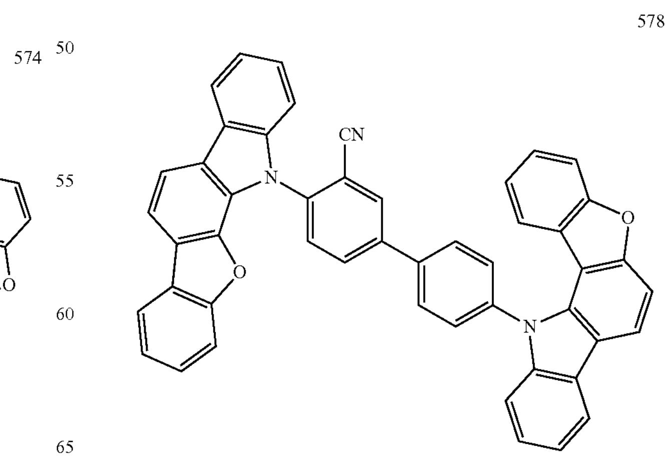

-continued
579
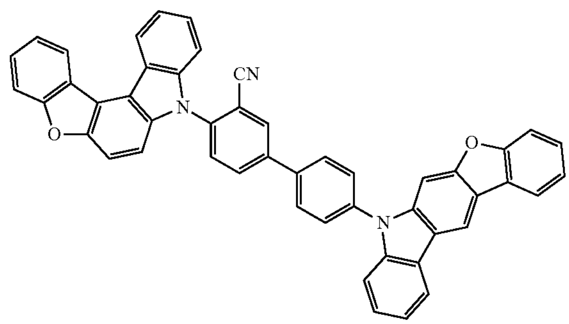
580
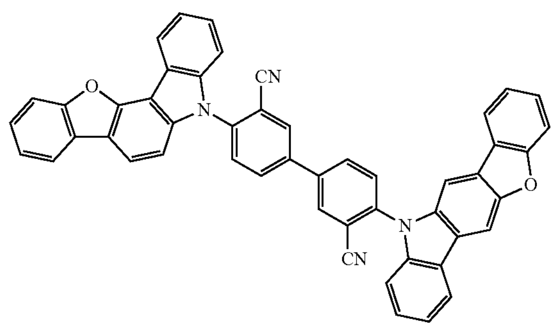
581
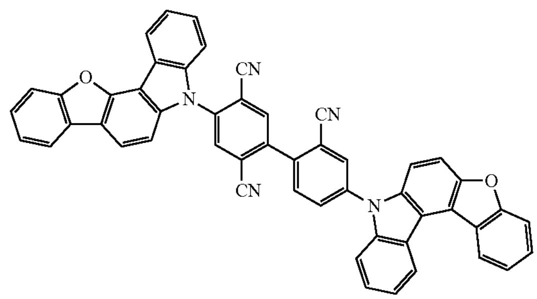
582
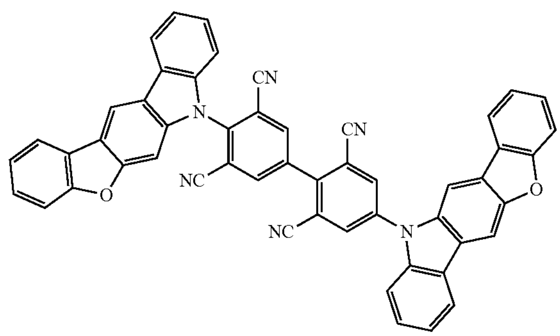
-continued
583
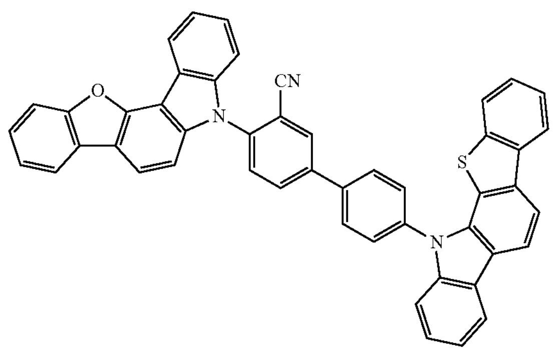
584
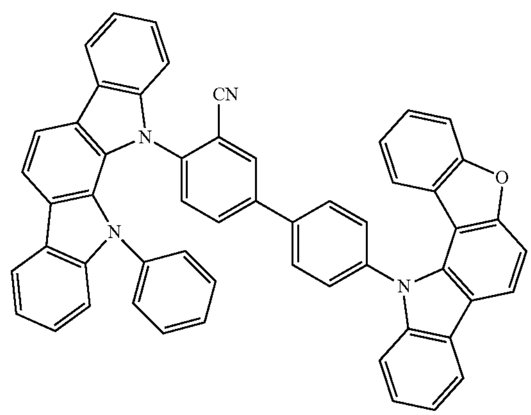
585
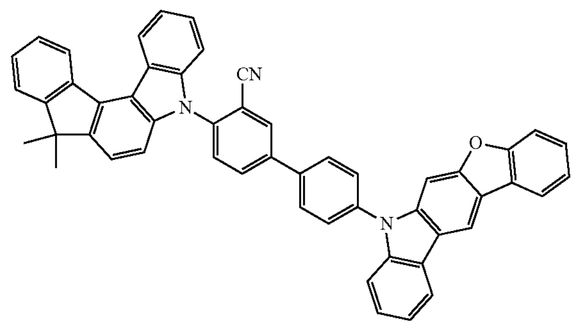
586
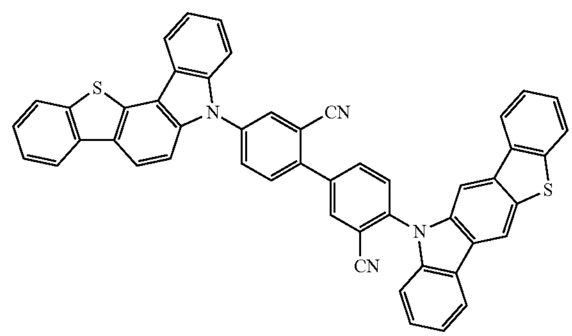

-continued
587
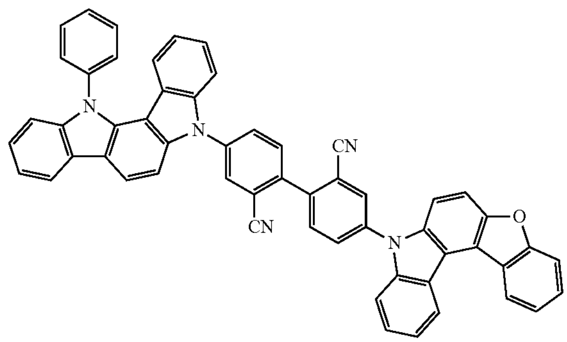
588
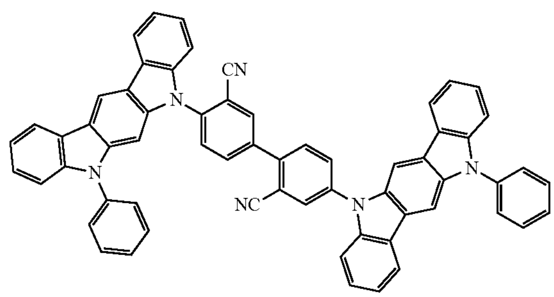
589
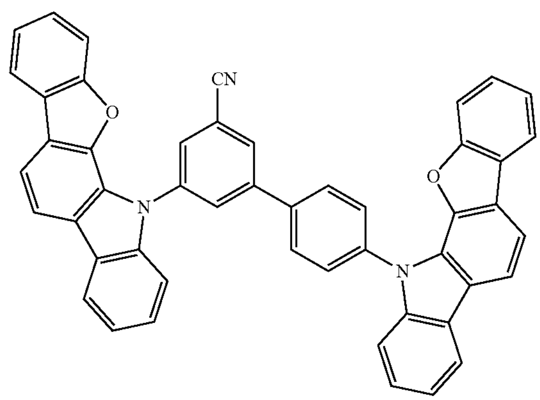
590
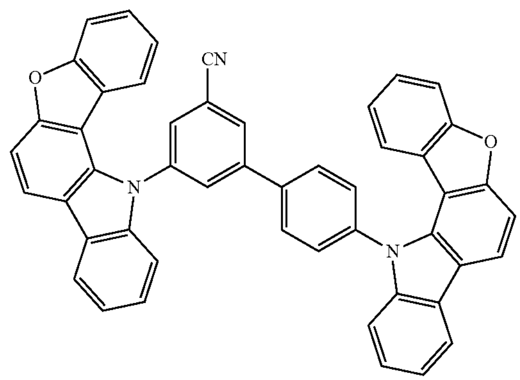
-continued
591
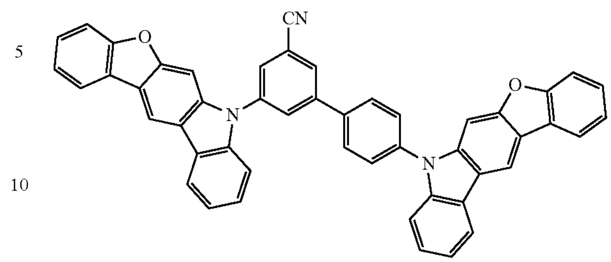
592
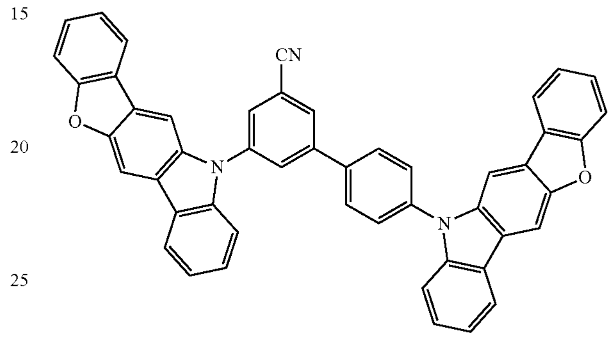
593
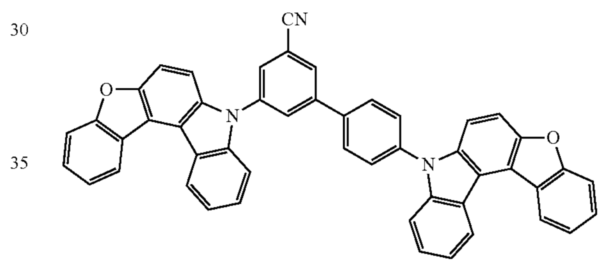
594
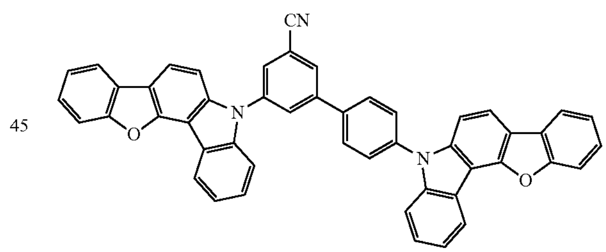
595
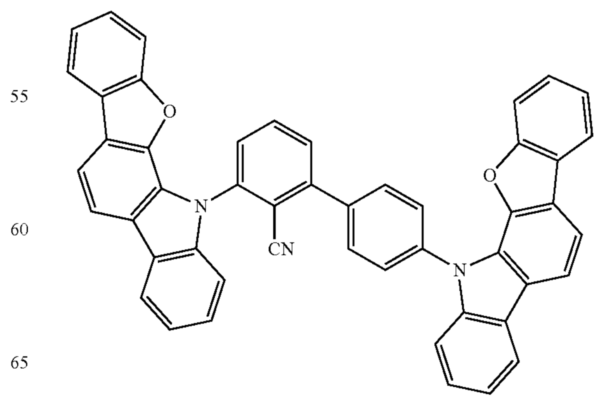

-continued
596
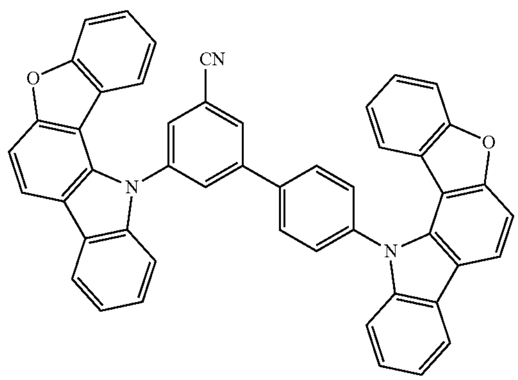
597
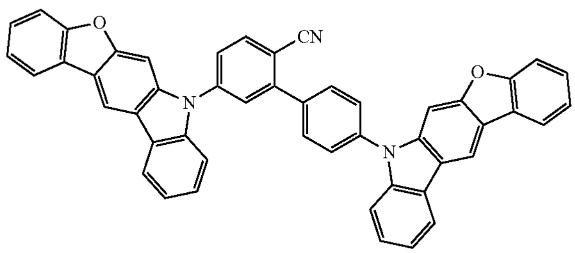
598
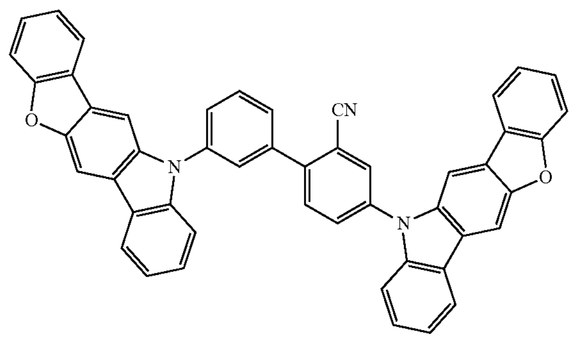
599
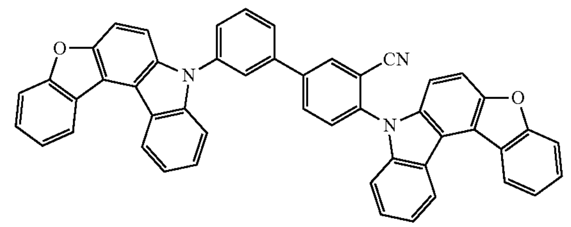
600
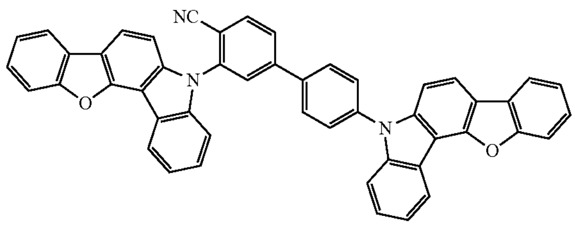
-continued
601
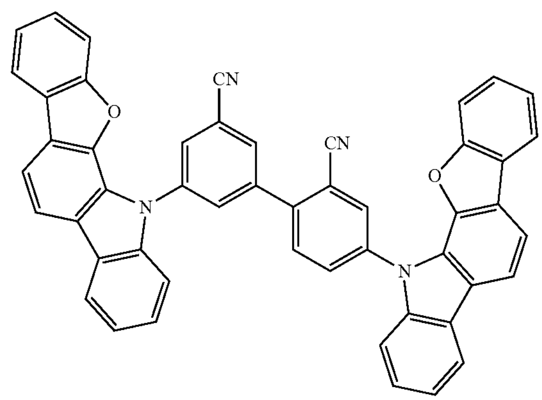
602
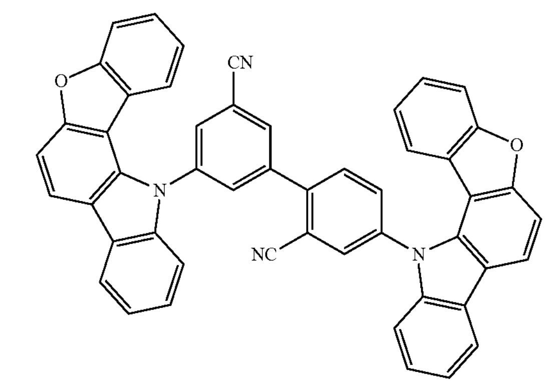
603
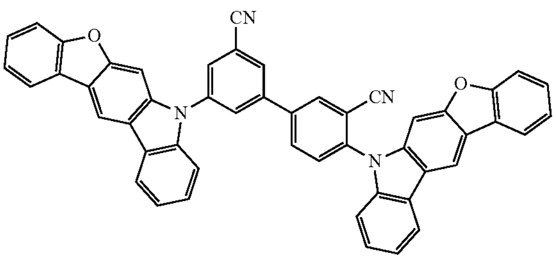
604
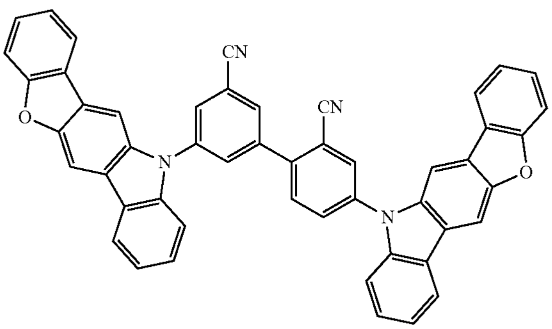

-continued
605
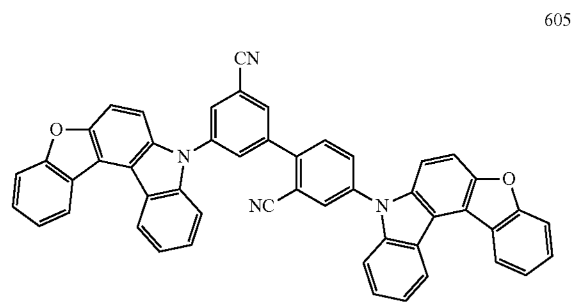
606
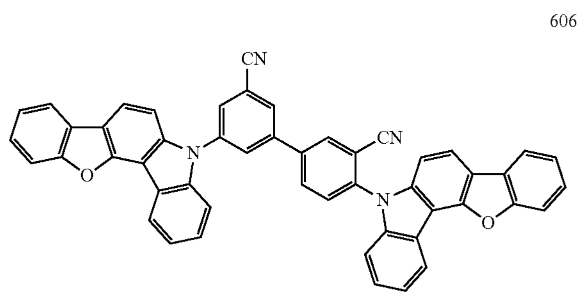
607
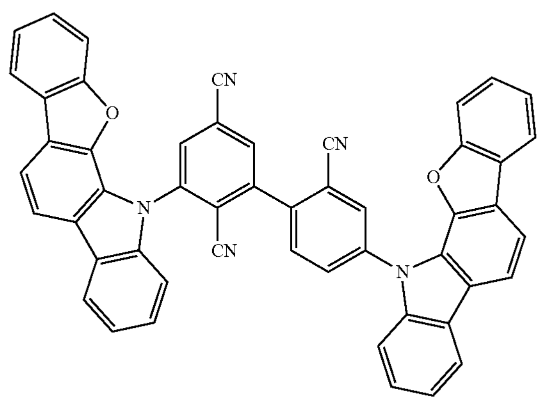
608
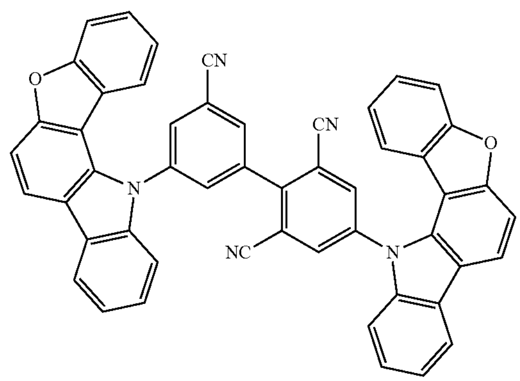
-continued
609
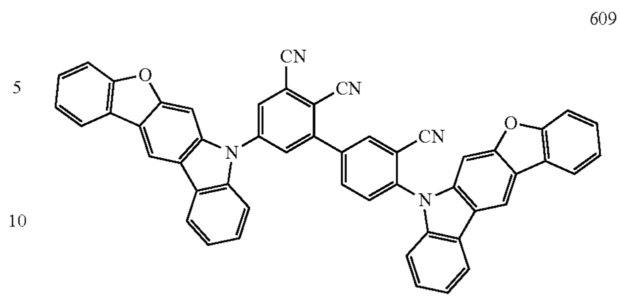
610
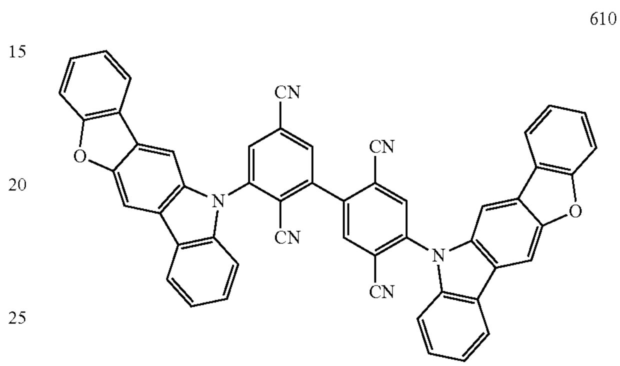
611
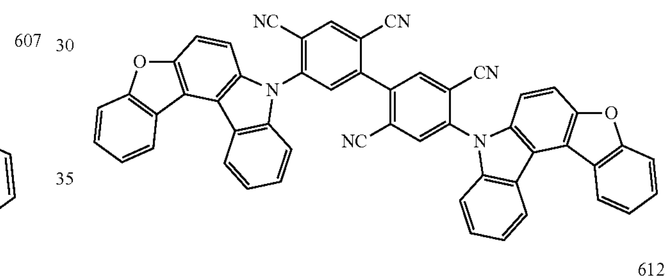
612
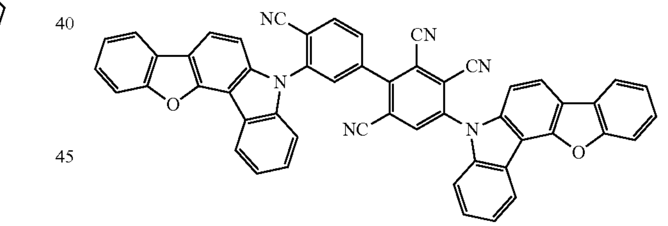
613
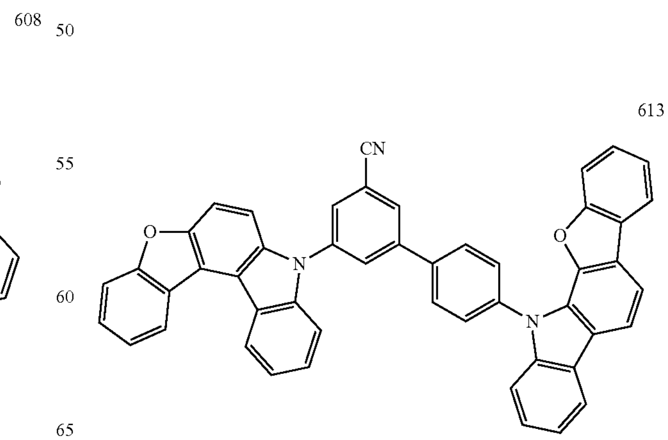

-continued
614
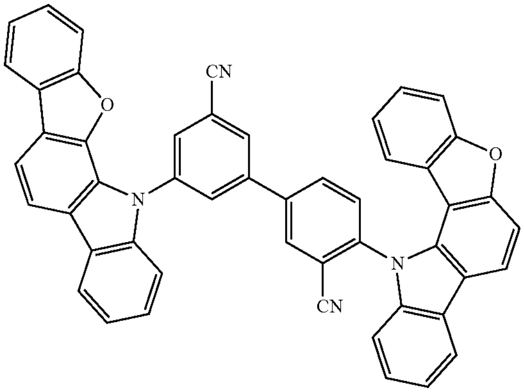
615
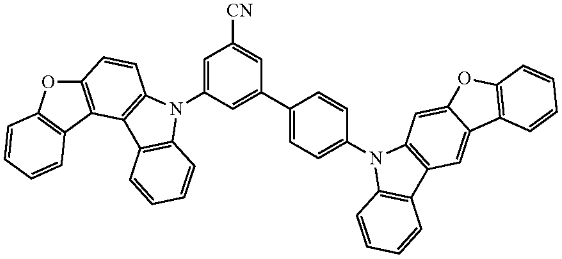
616
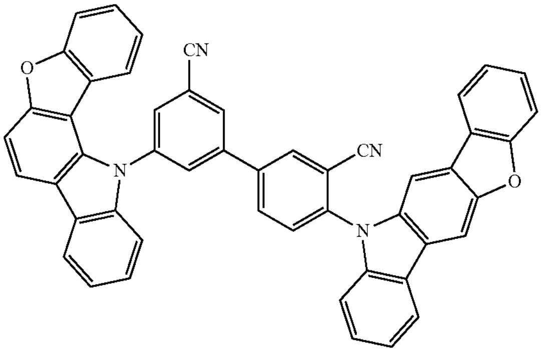
617
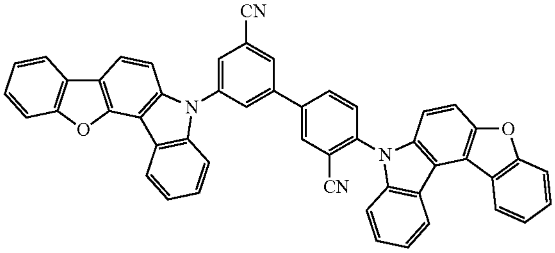
-continued
618
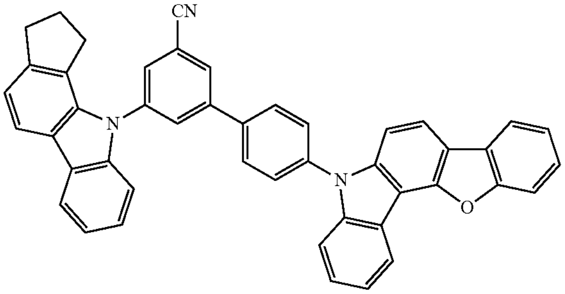
619
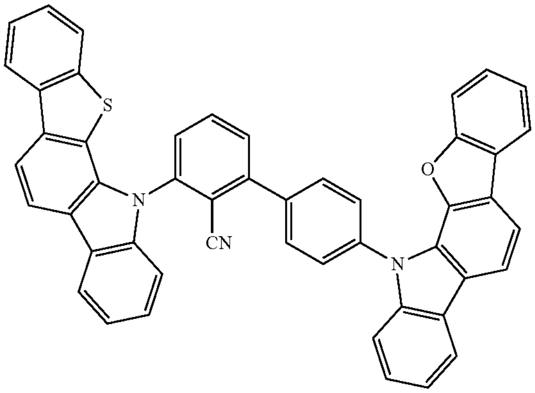
620
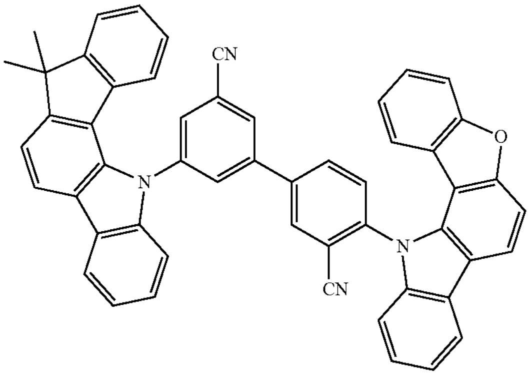
621
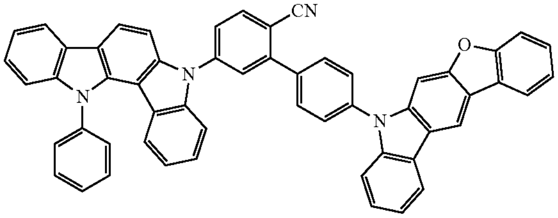

-continued
622
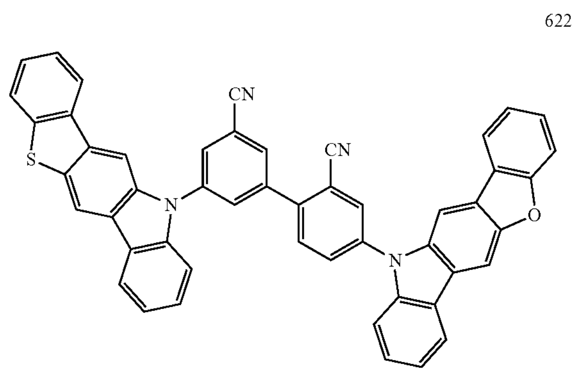
623
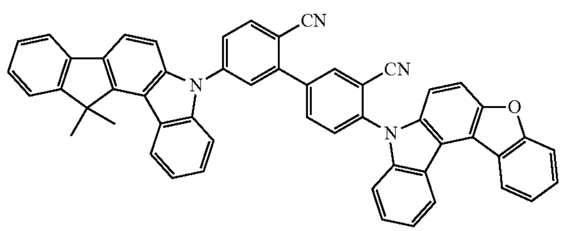
624
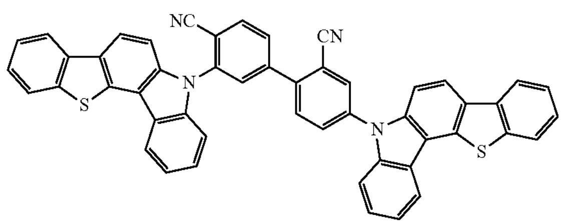
625
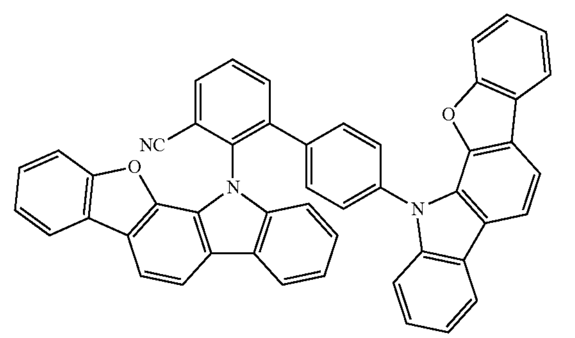
626
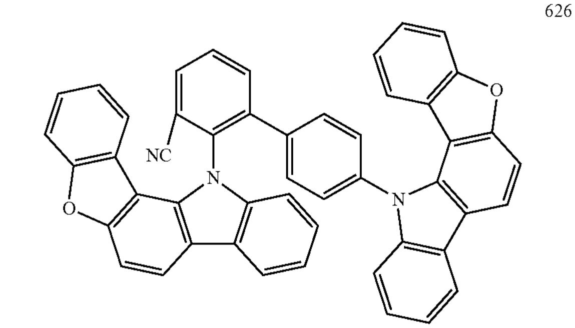
-continued
627
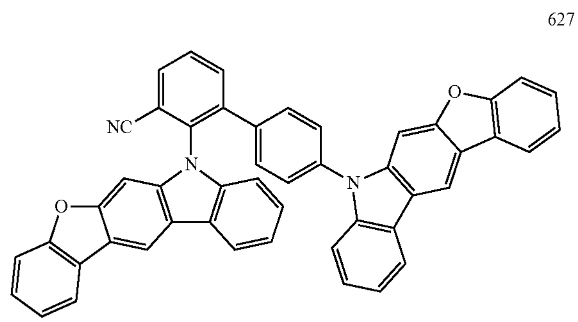
628
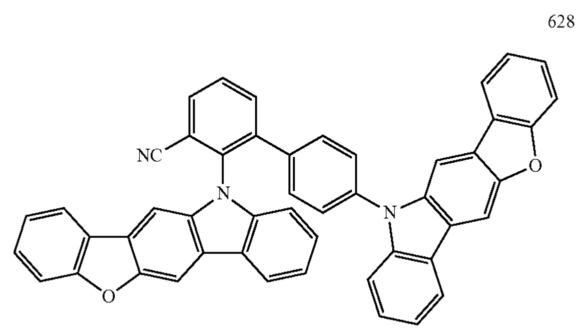
629
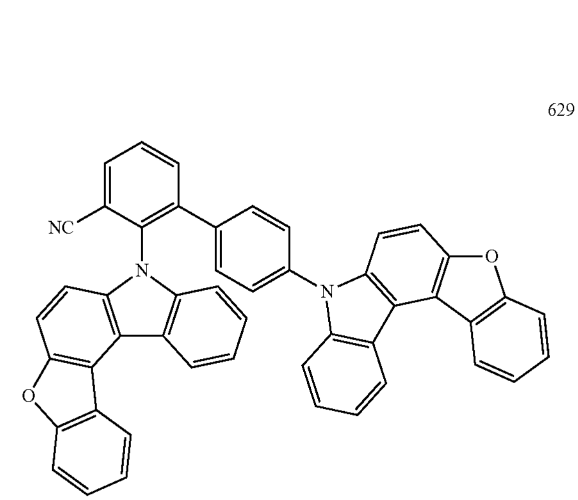
630
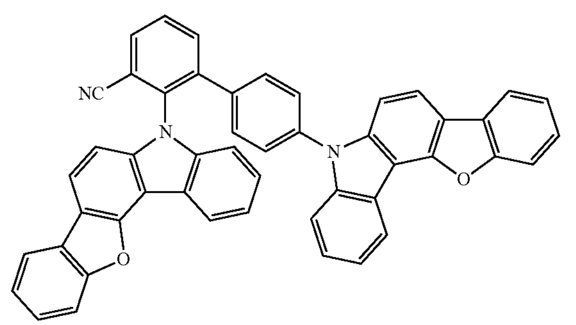

-continued
631
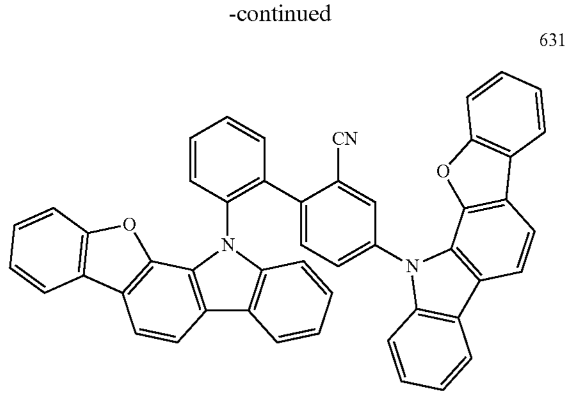
632
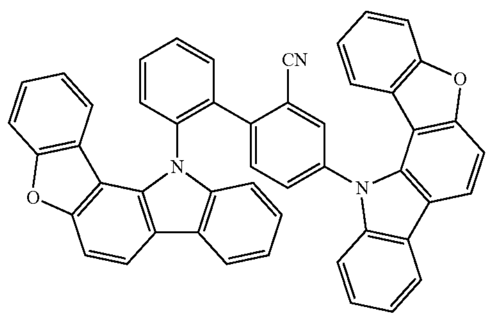
633
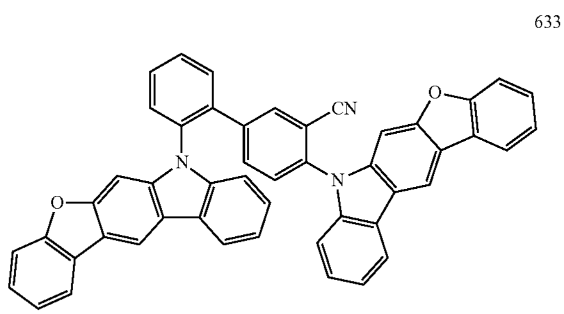
634
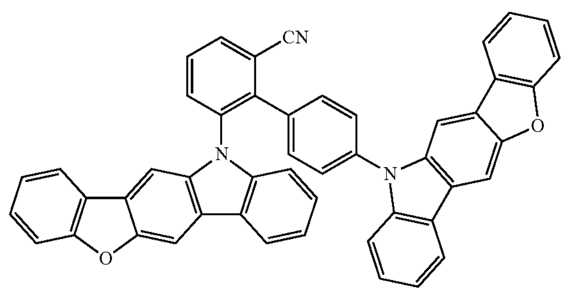
635
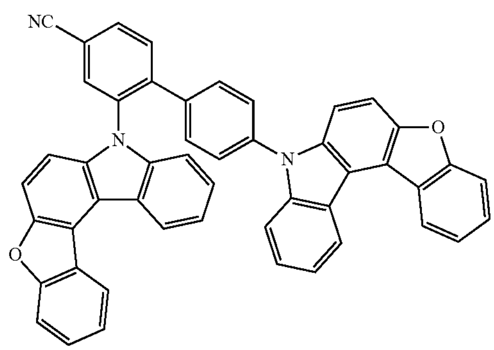
-continued
636
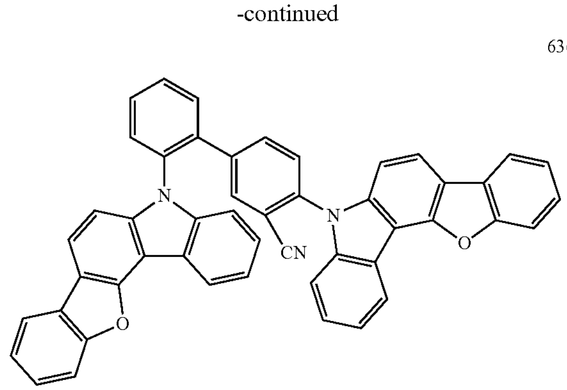
637
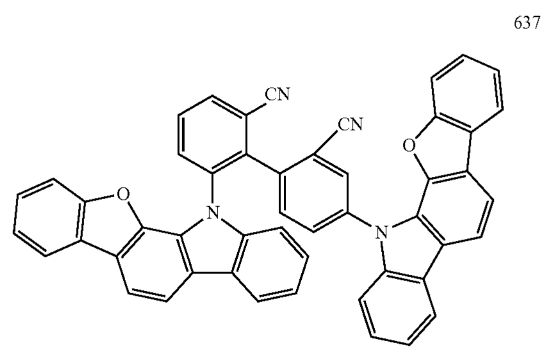
638
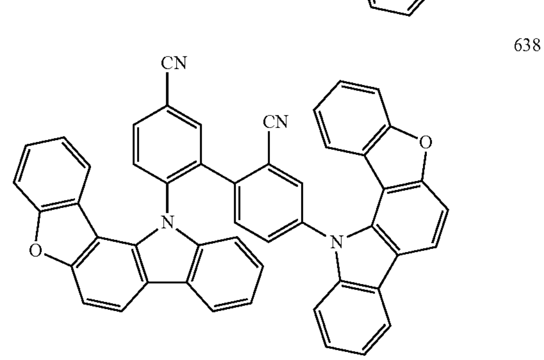
639
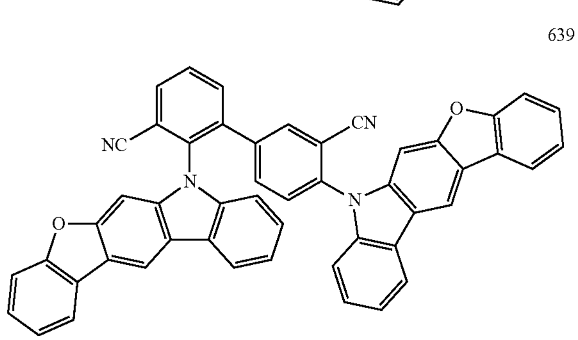
640
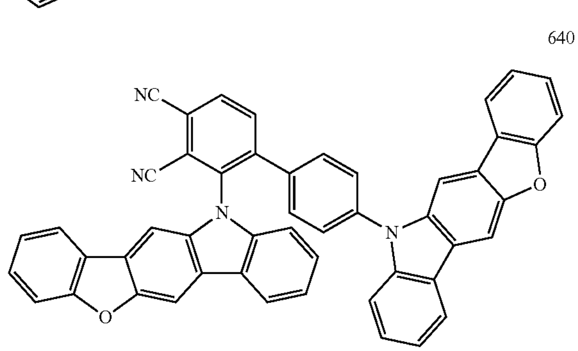

-continued
641
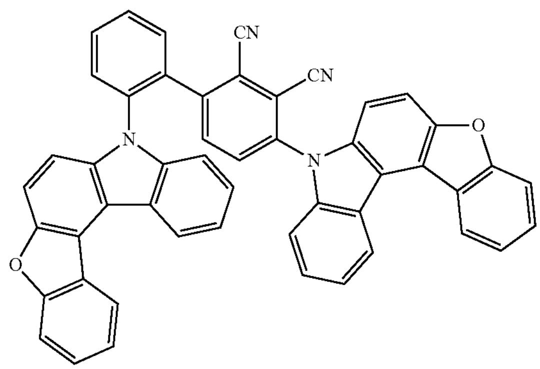
642
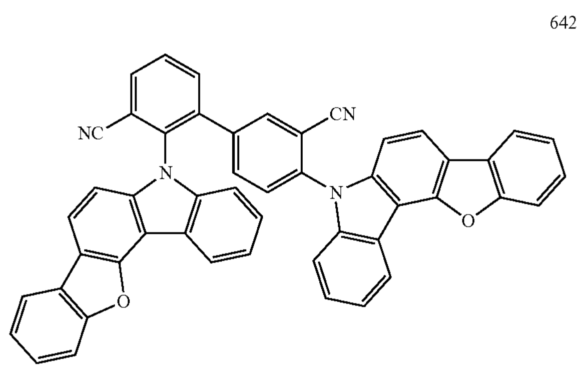
643
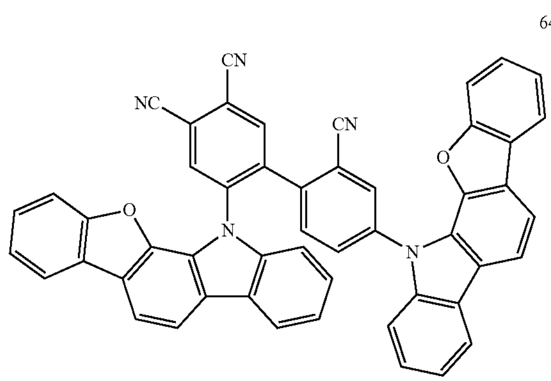
644
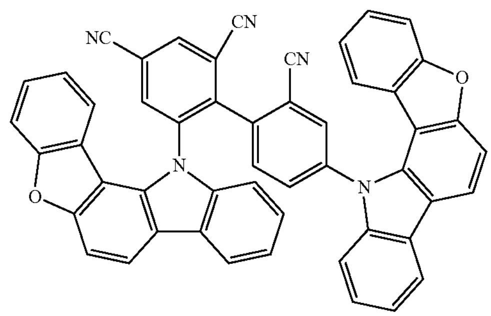
-continued
645
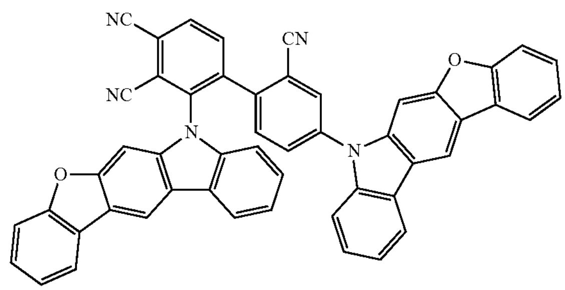
646
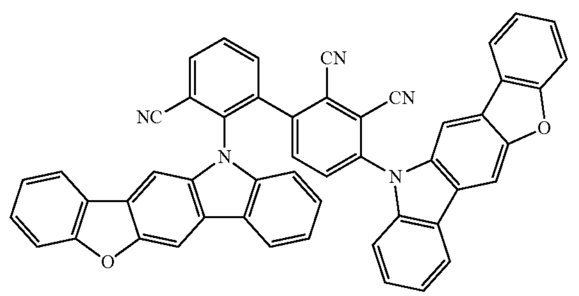
647
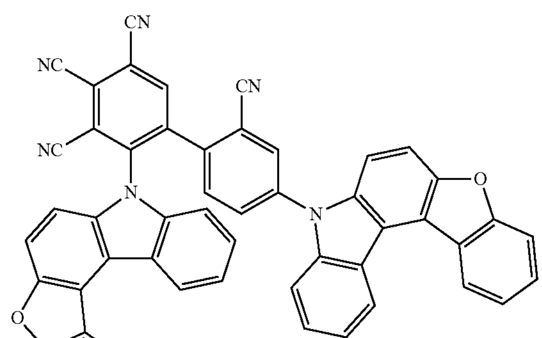
648
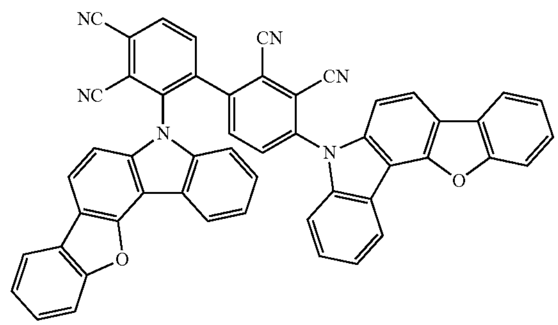

-continued
649
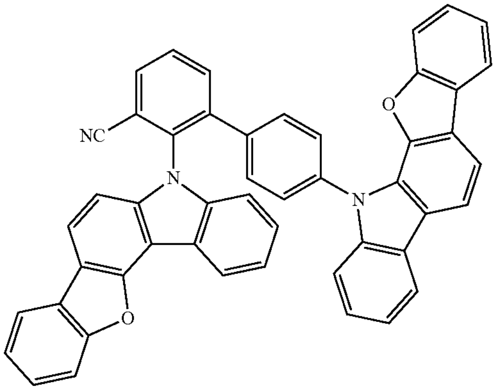
650
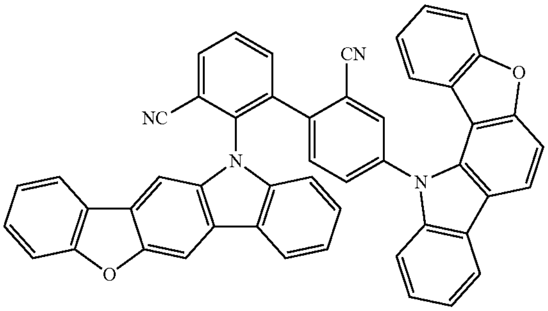
651
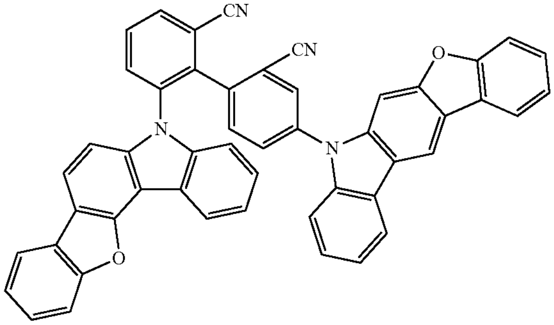
652
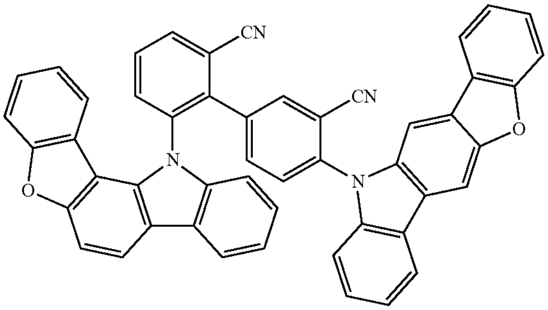
-continued
653
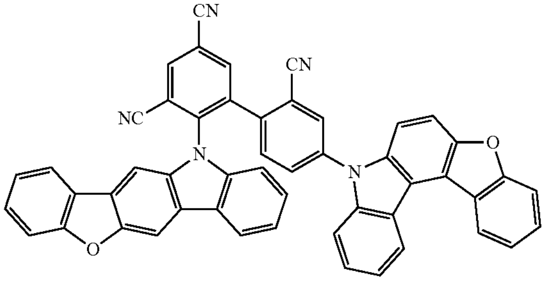
654
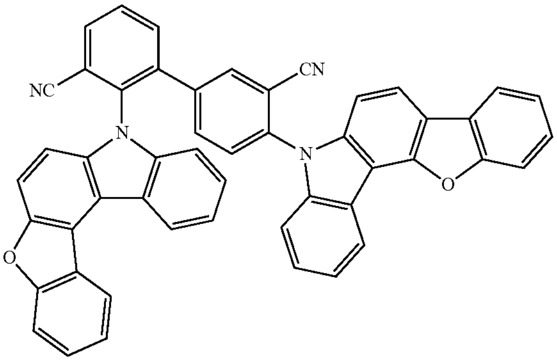
655
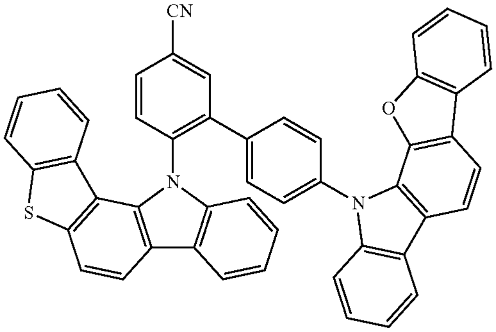
656
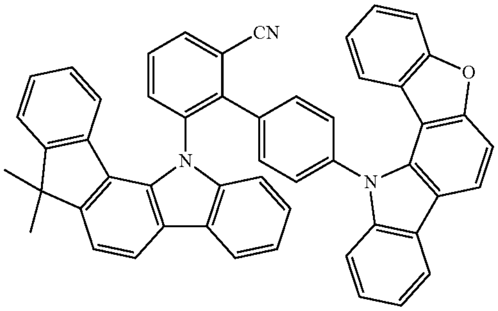

-continued
657
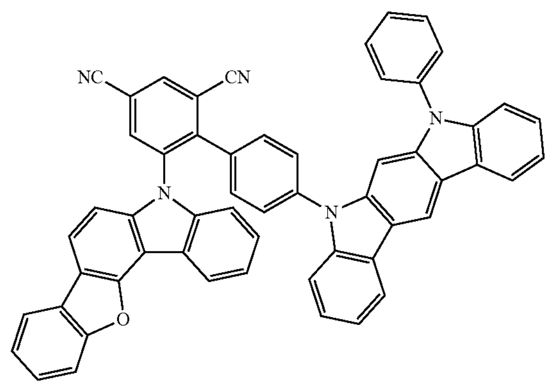
658
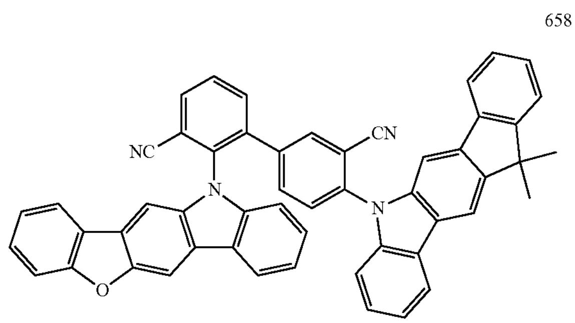
659
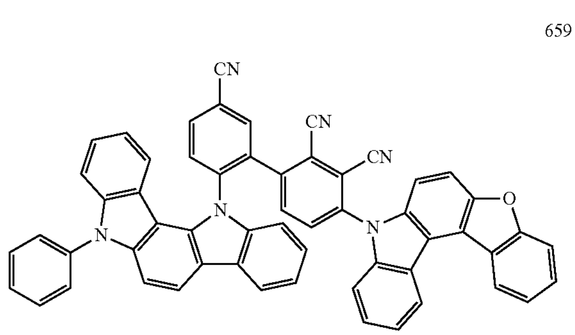
660
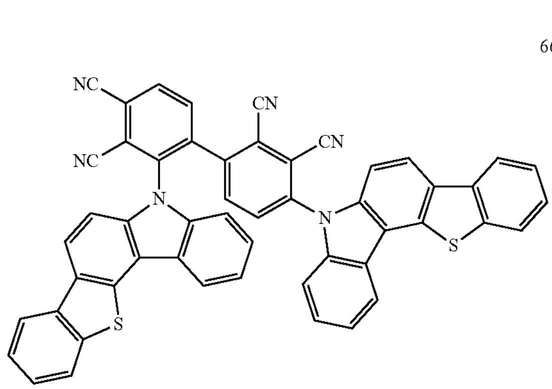
-continued
661
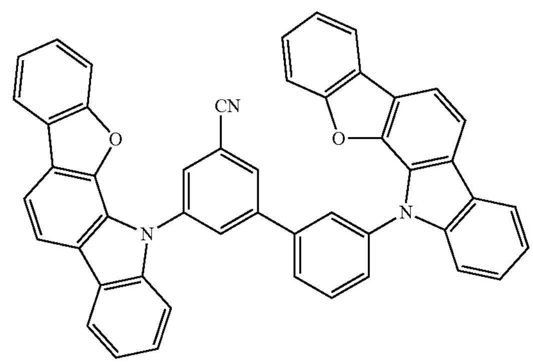
662
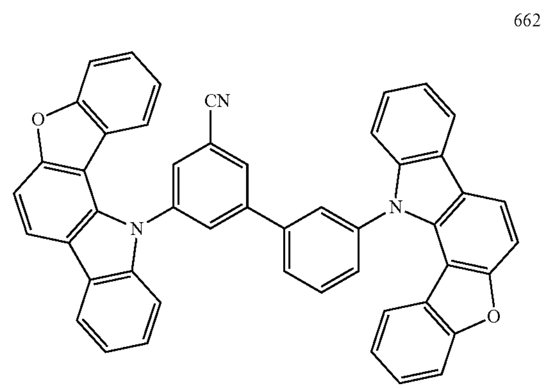
663
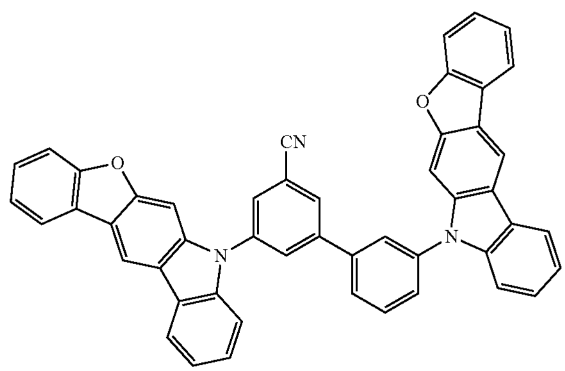
664
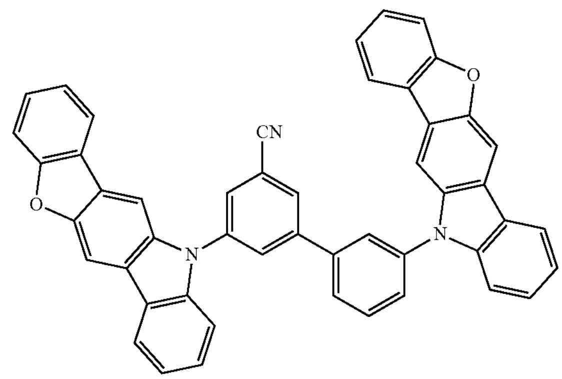

665
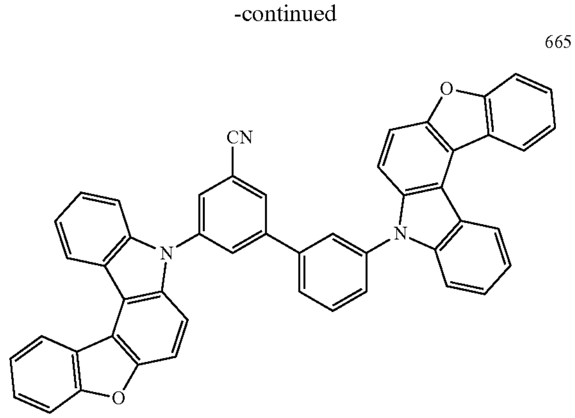
666
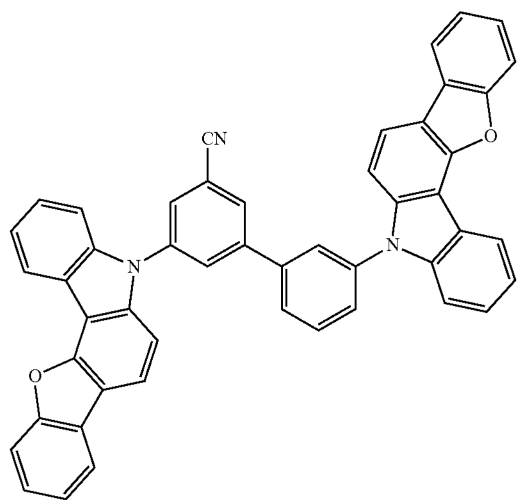
667
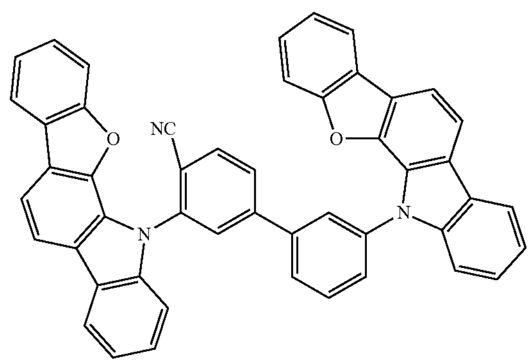
668
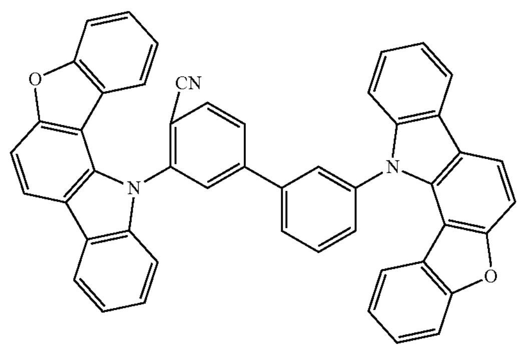
669
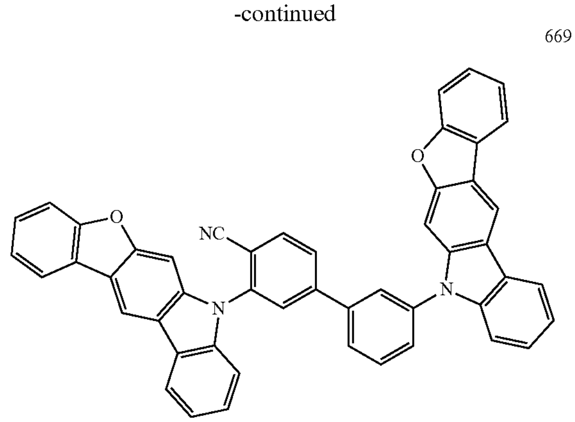
670
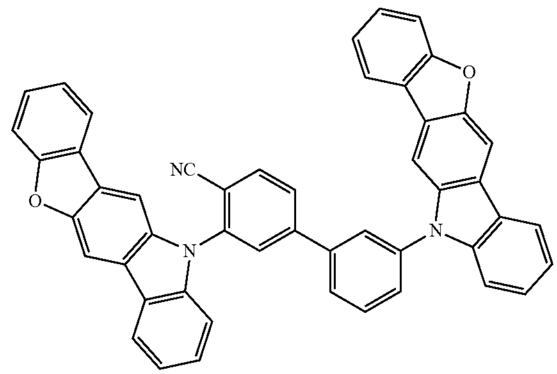
671
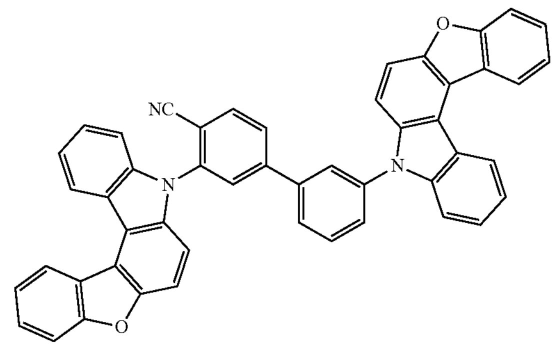
672
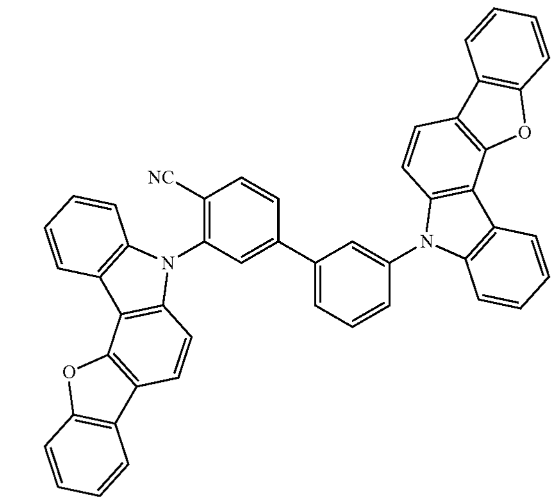

-continued
673
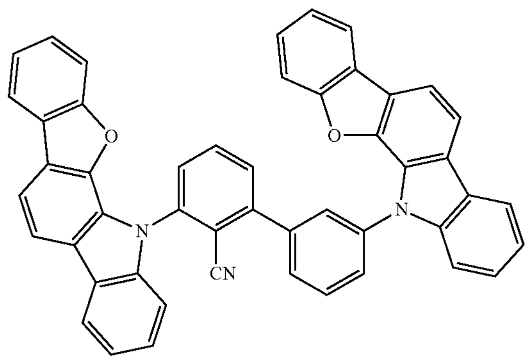
674
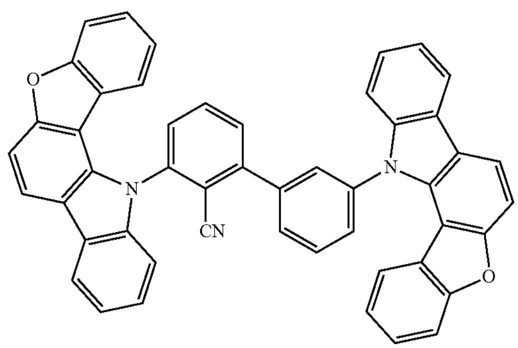
675
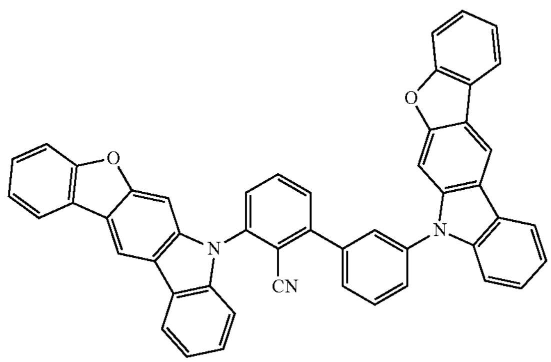
676
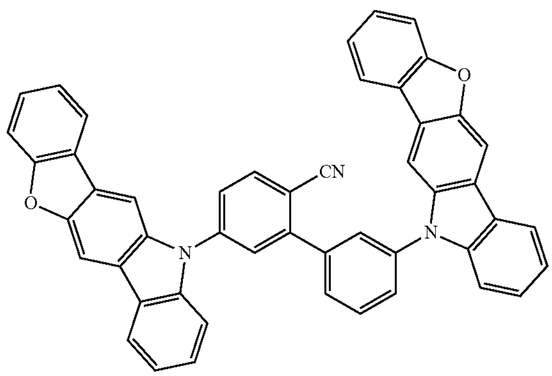
-continued
677
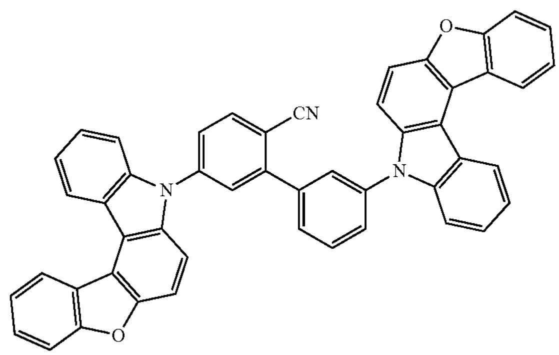
678
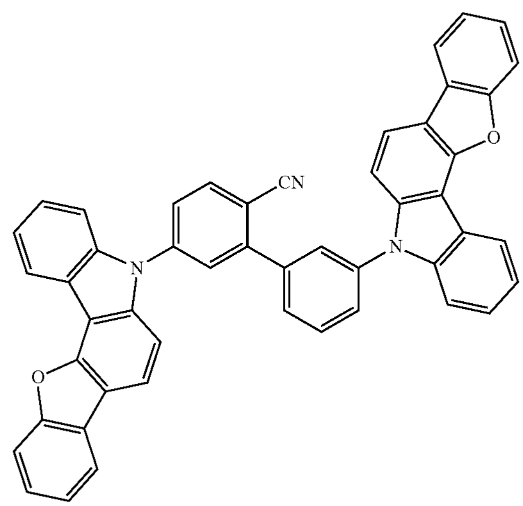
679
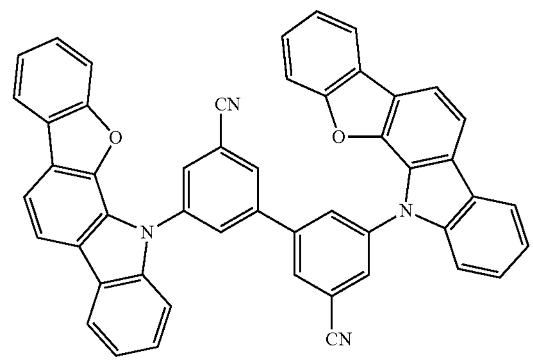
680
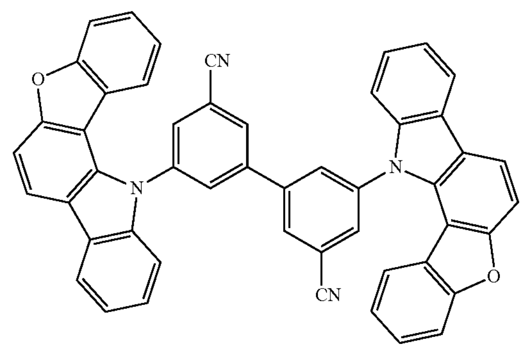

-continued
681
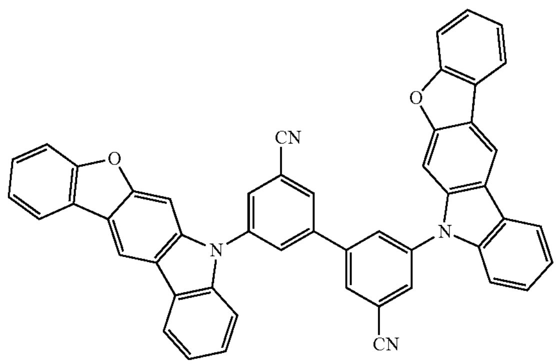
682
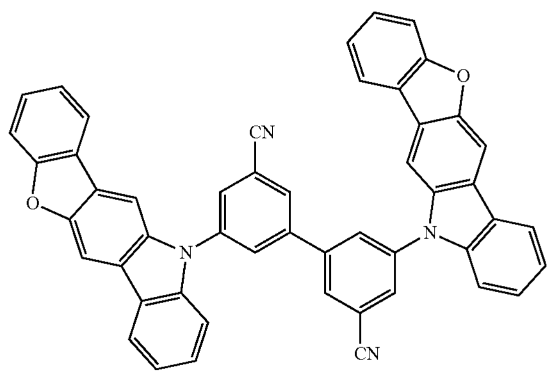
683
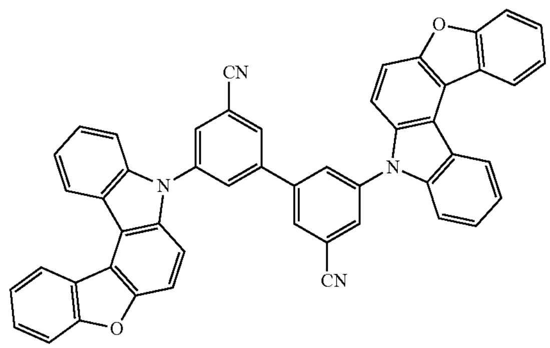
684
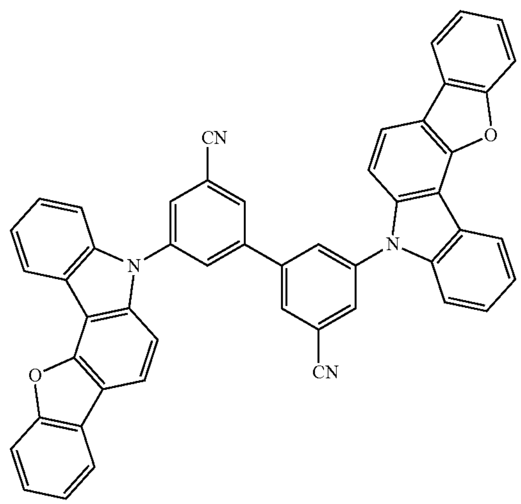
-continued
685
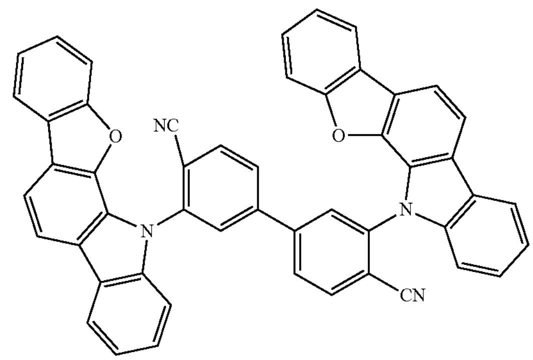
686
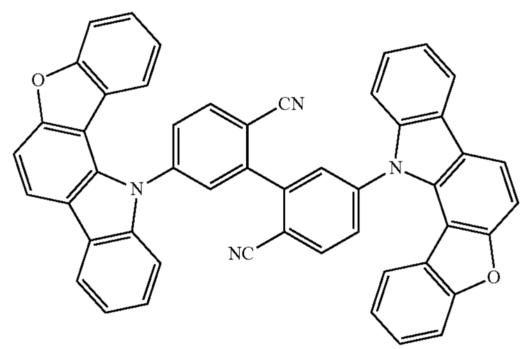
687
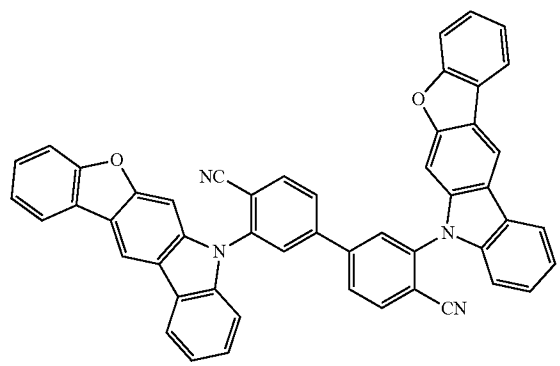
688
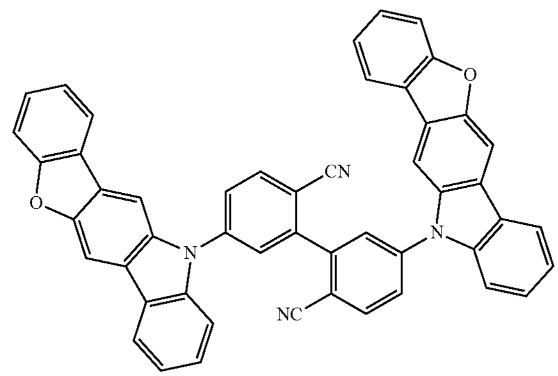

-continued
689
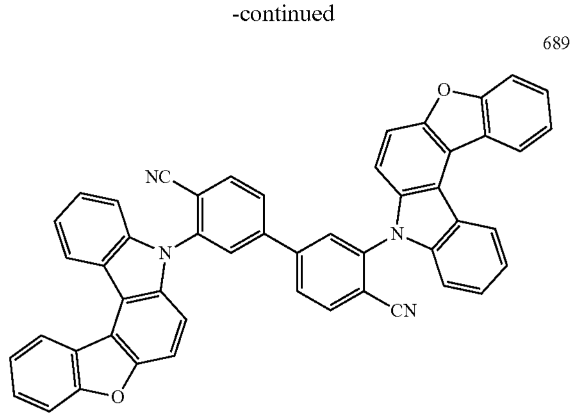
690
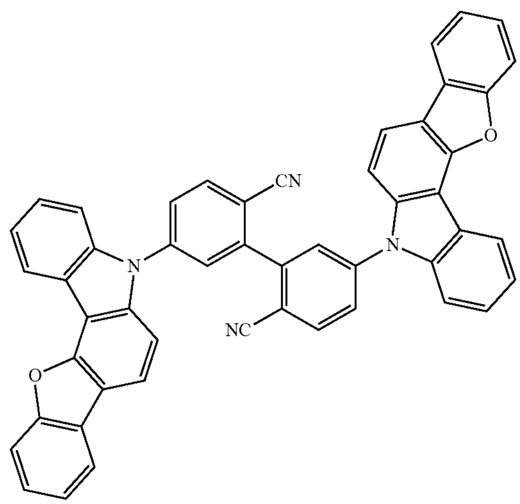
691
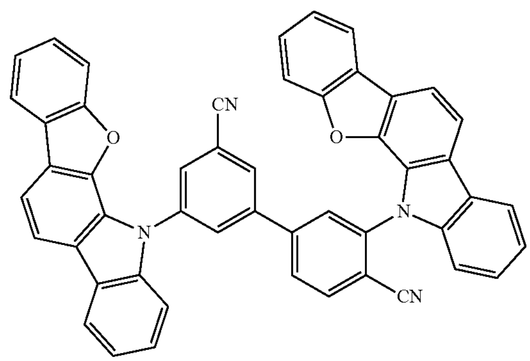
692
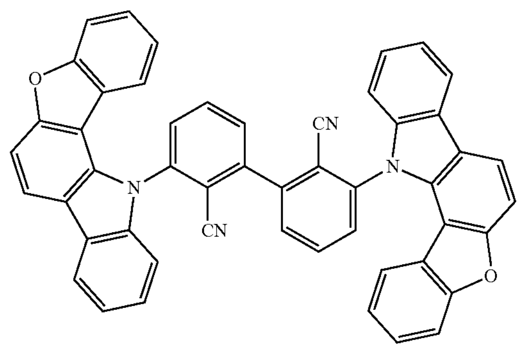
-continued
693
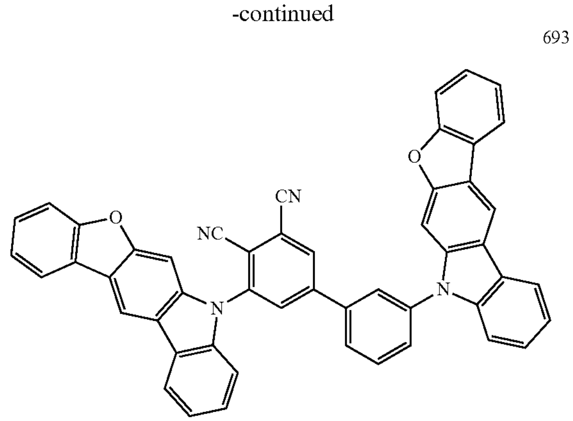
694
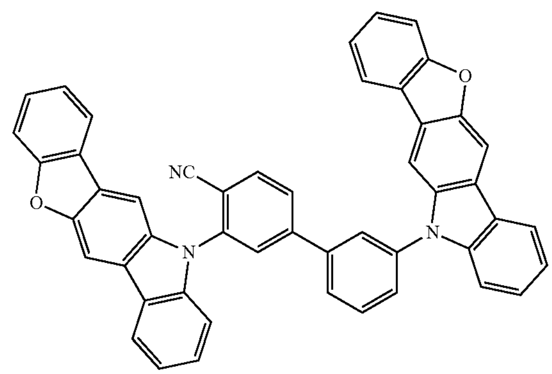
695
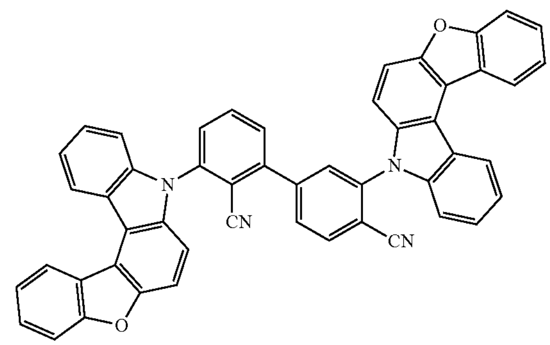
696
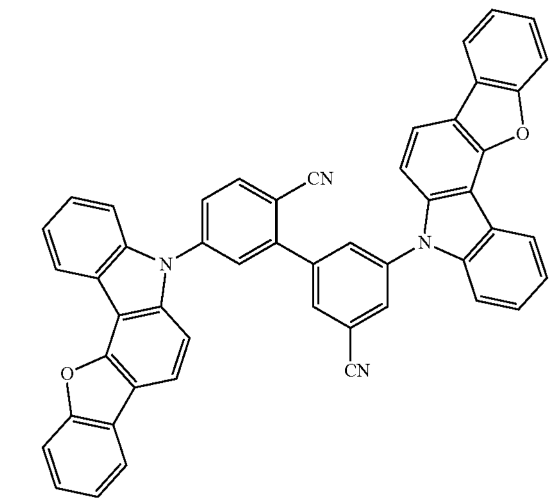

-continued
697
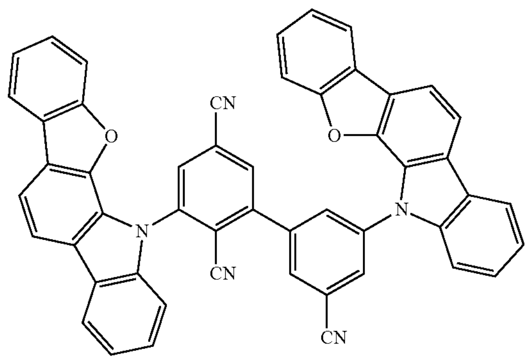
698
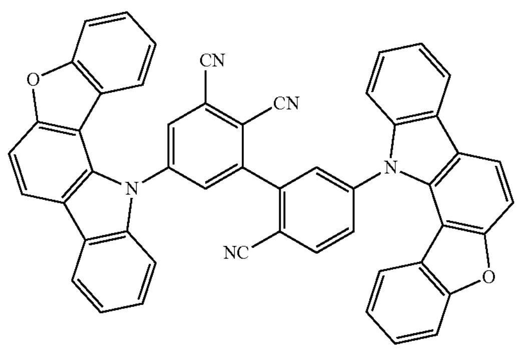
699
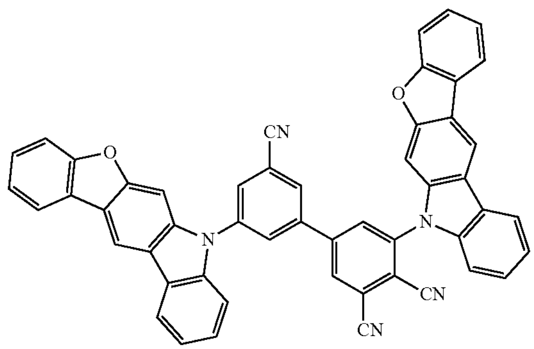
700
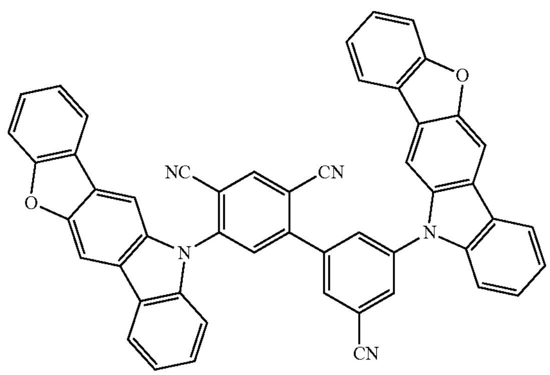
-continued
701
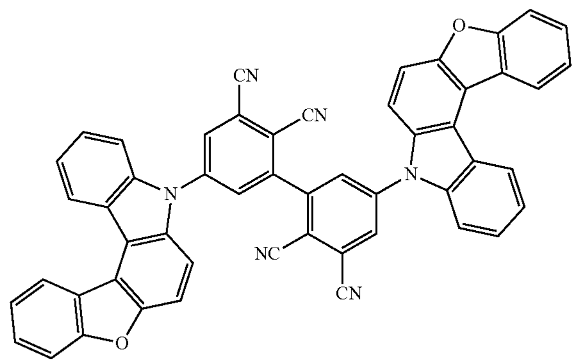
702
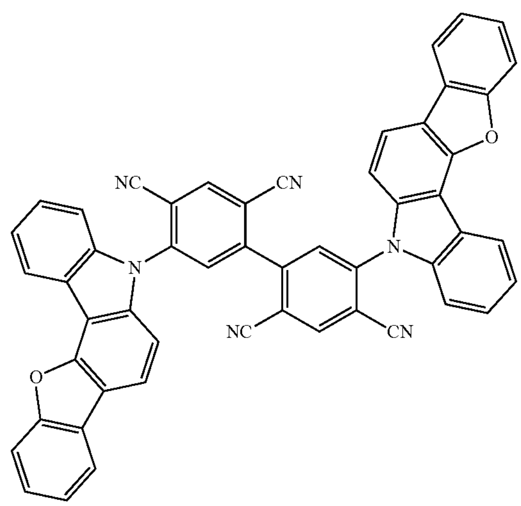
703
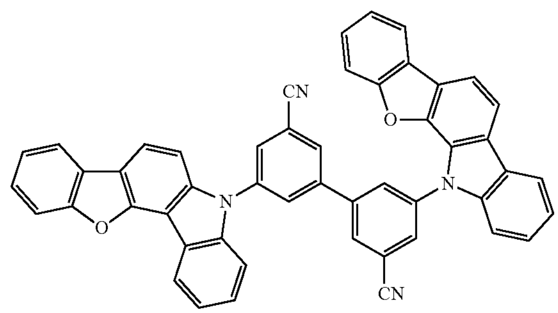
704
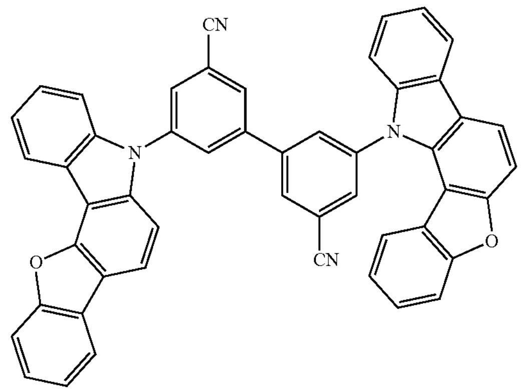

-continued
705
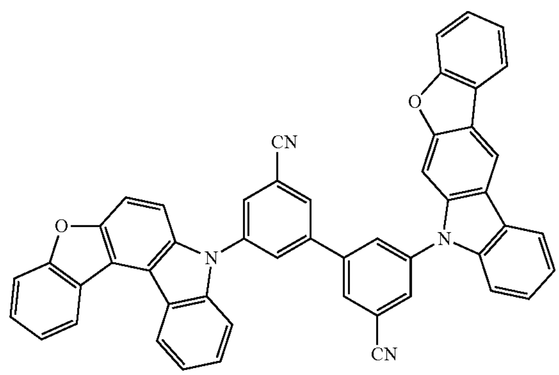
706
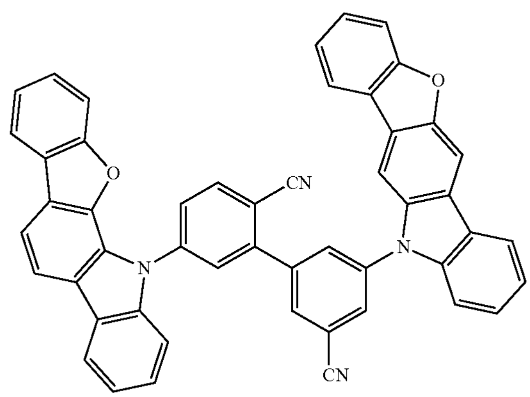
707
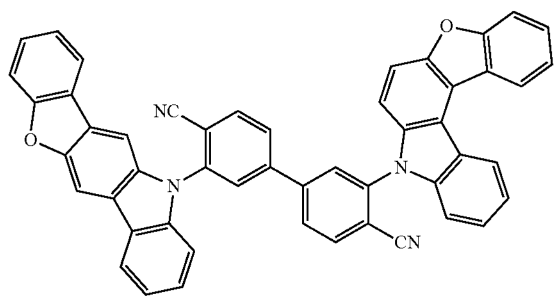
708
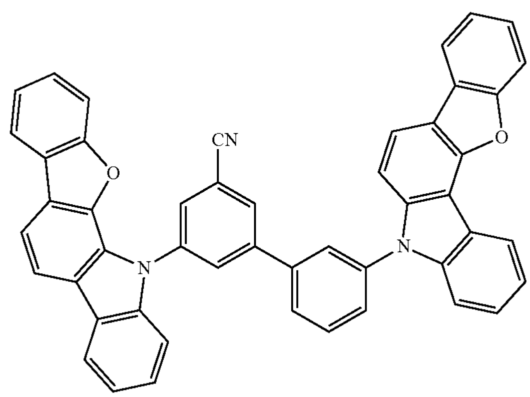
-continued
709
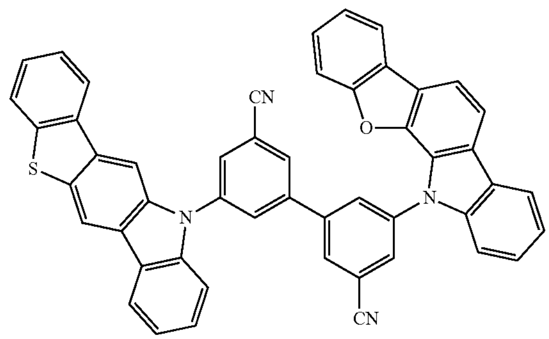
710
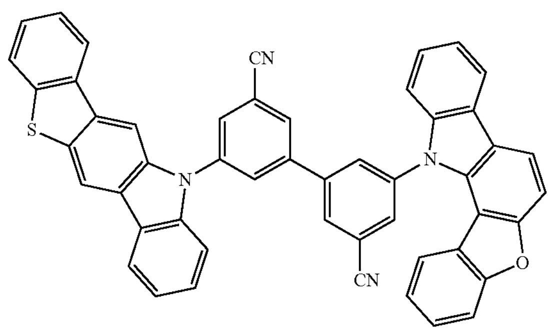
711
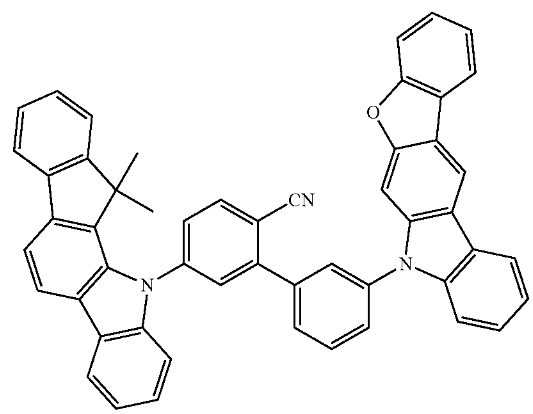
712
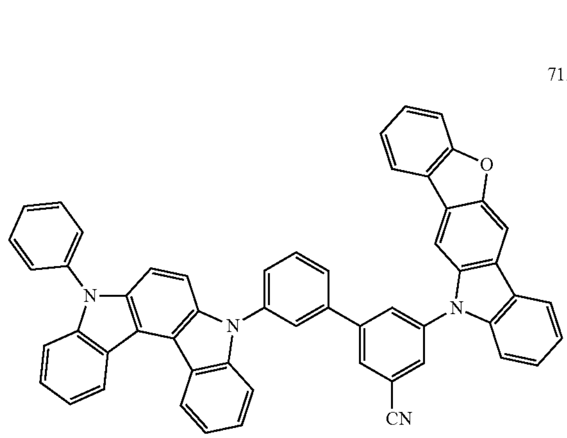

713
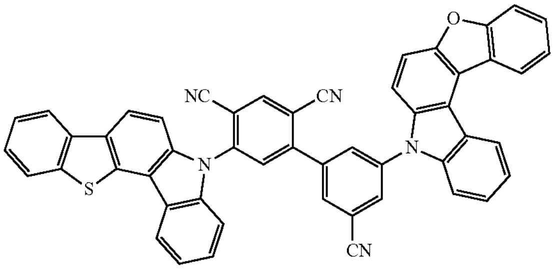
714
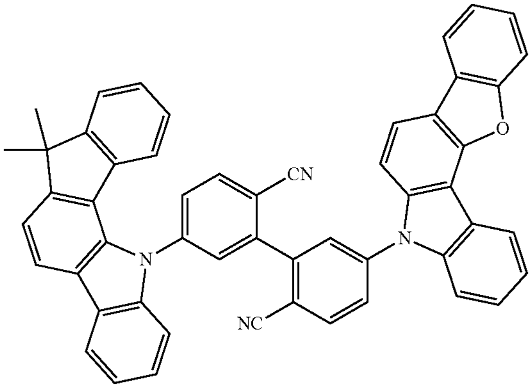
715
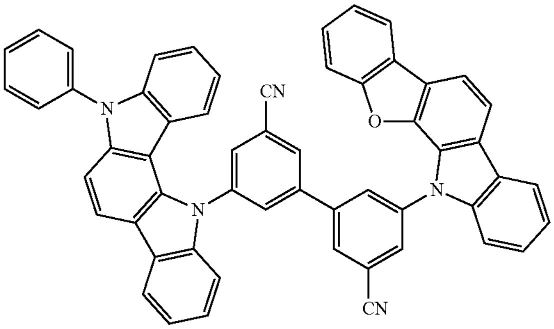
716
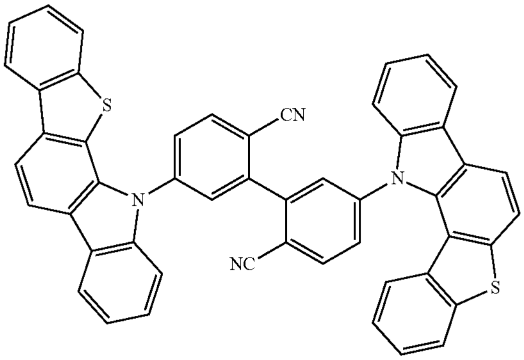
717
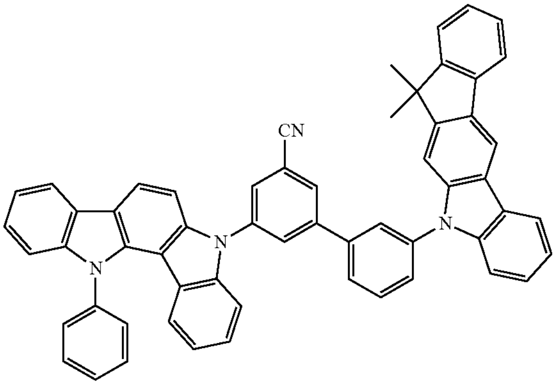
718
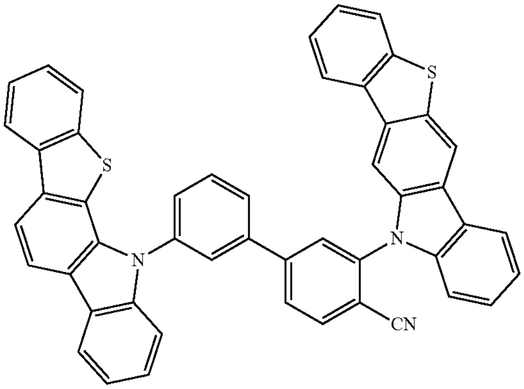
719
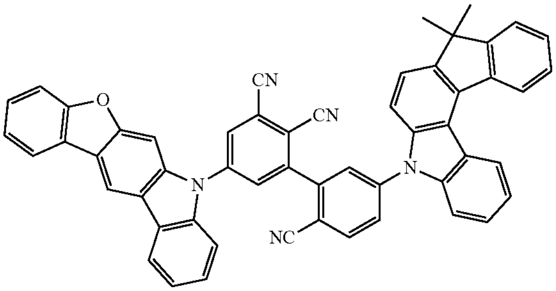
720
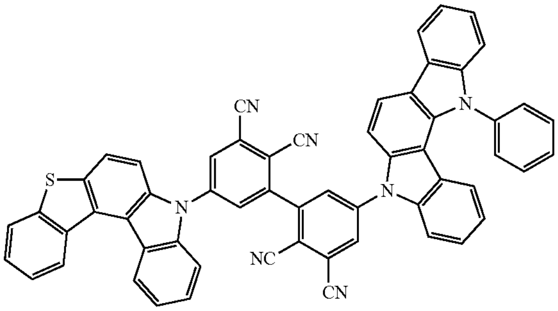

-continued
721
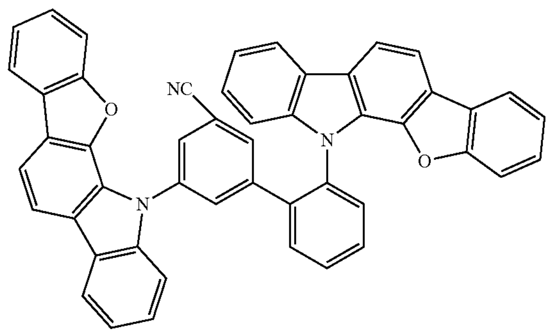
722
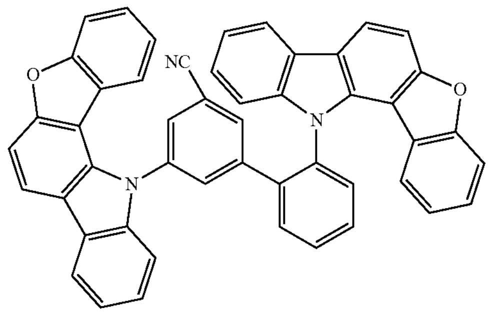
723
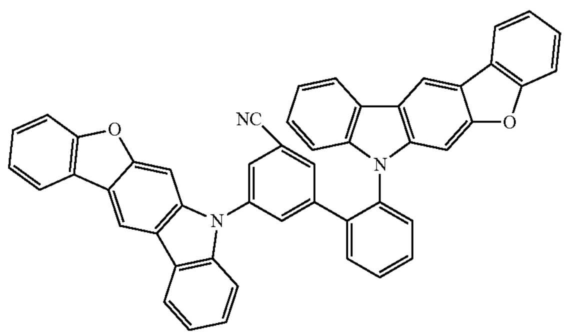
724
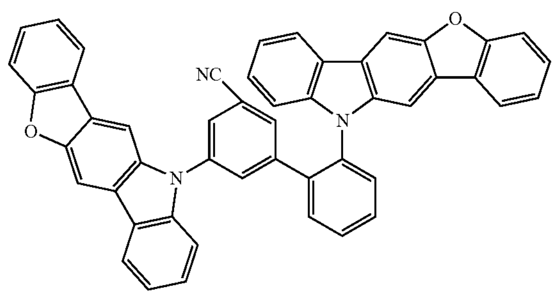
-continued
725
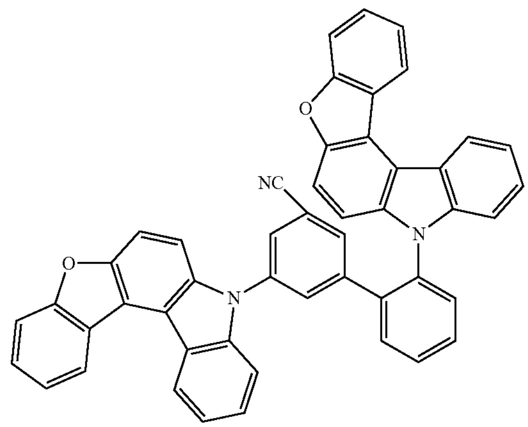
726
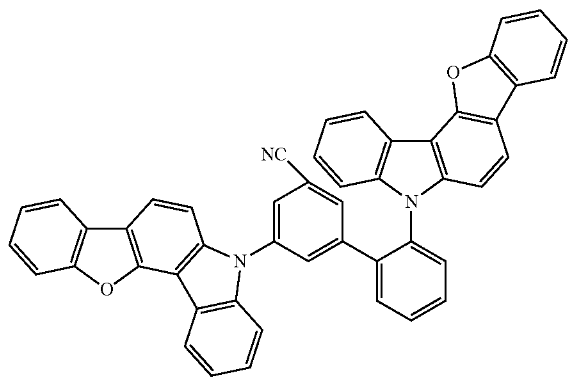
727
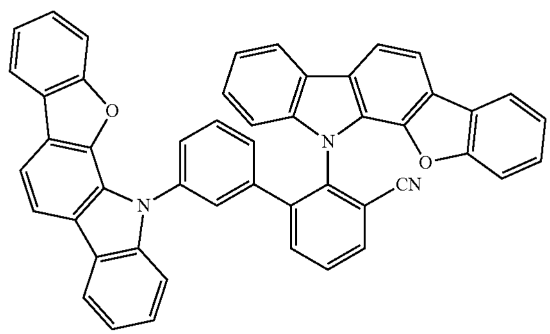
728
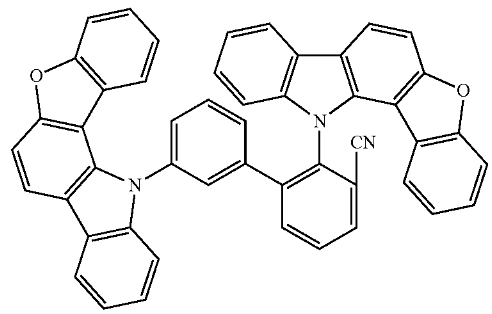

-continued
729
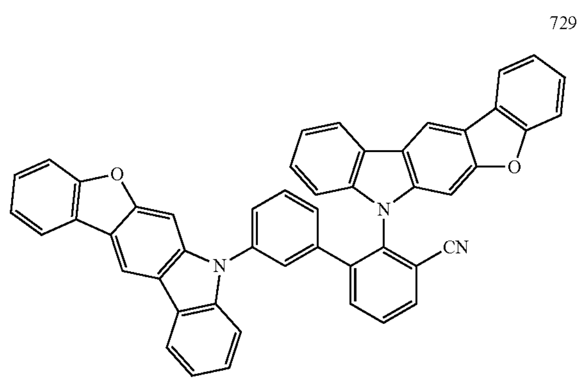
730
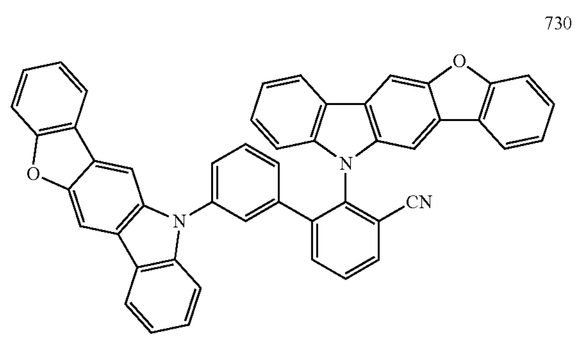
731
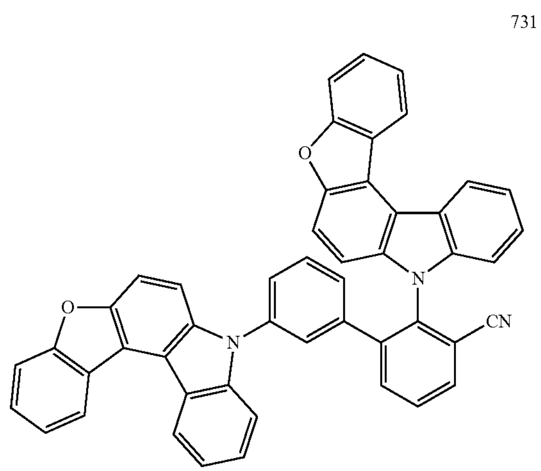
732
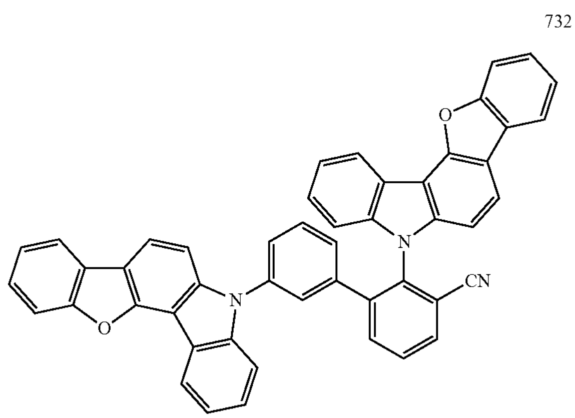
-continued
733
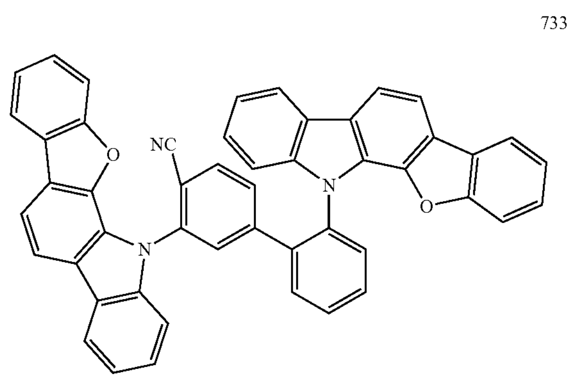
734
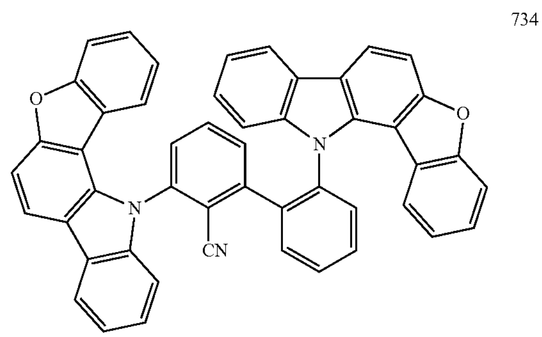
735
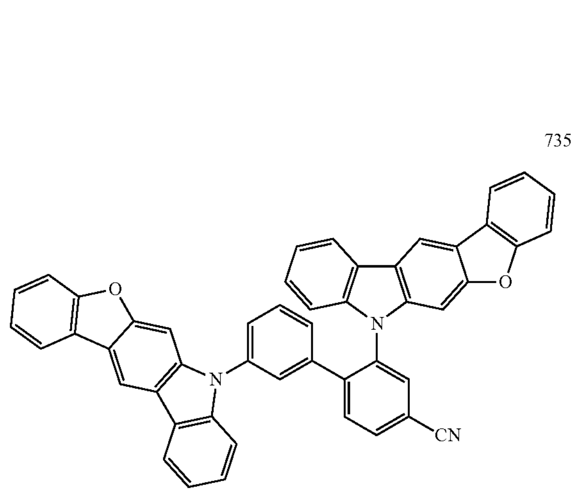
736
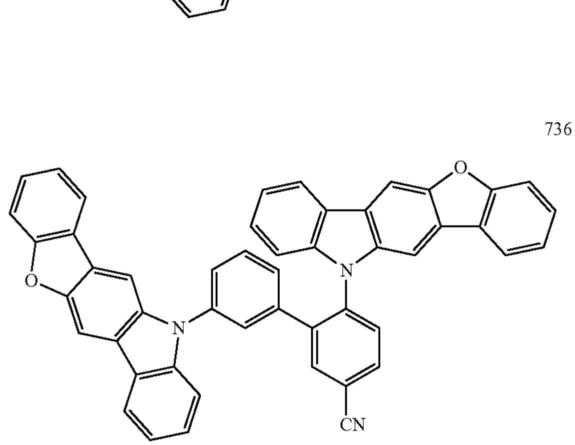

-continued
737
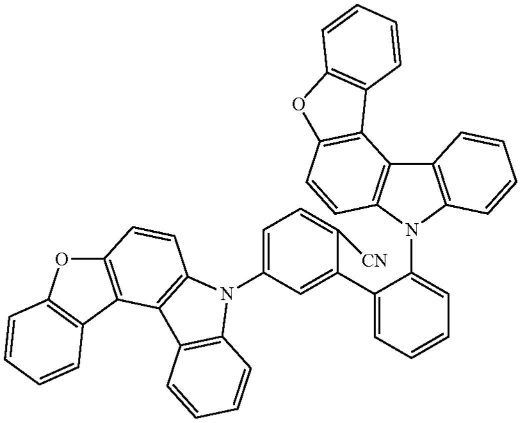
738
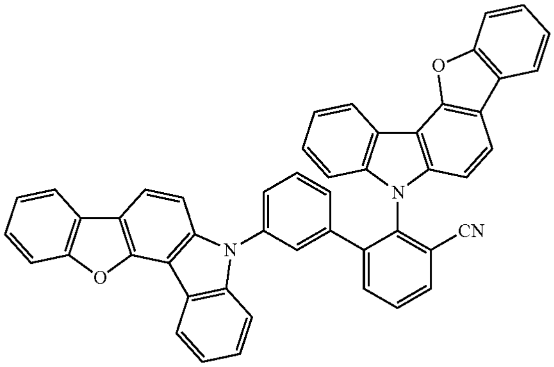
739
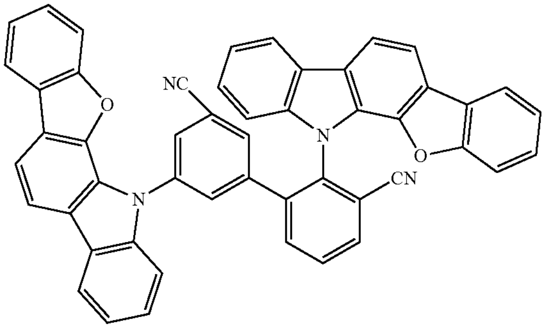
740
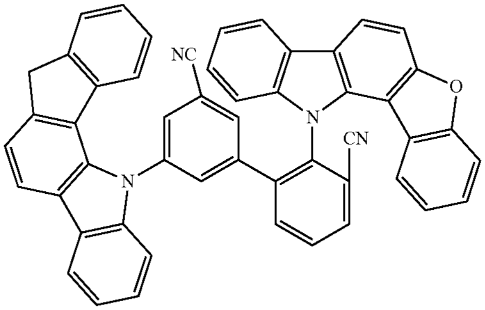
-continued
741
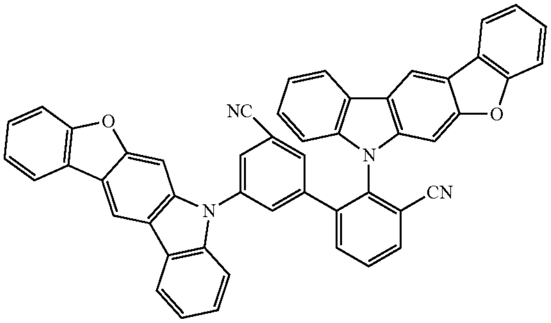
742
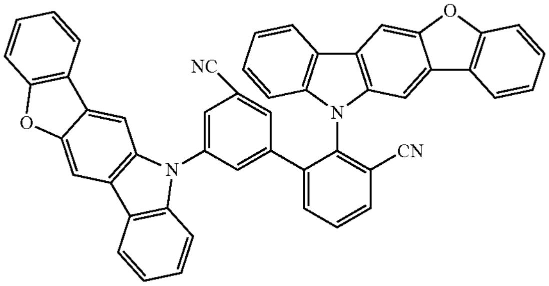
743
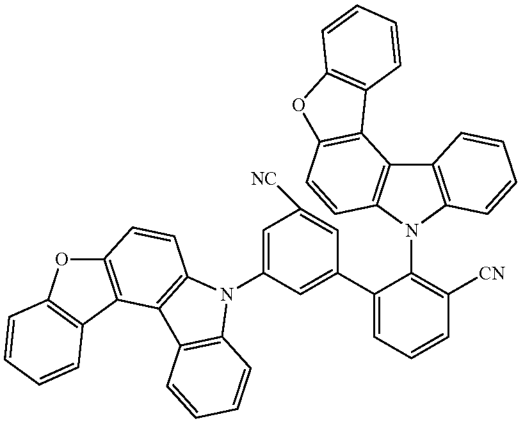
744
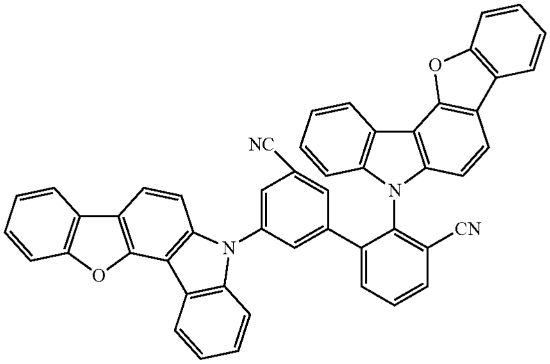

-continued
745
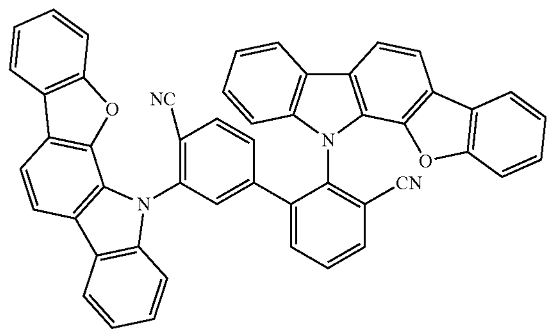
746
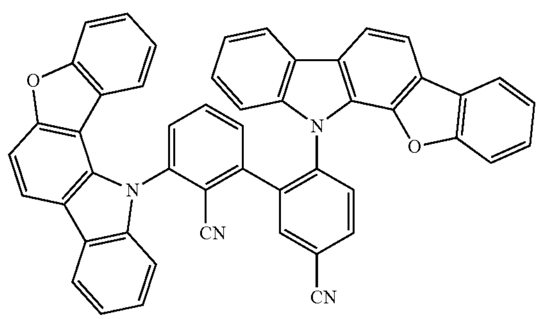
747
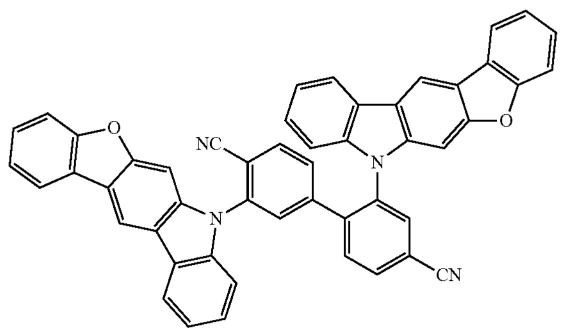
748
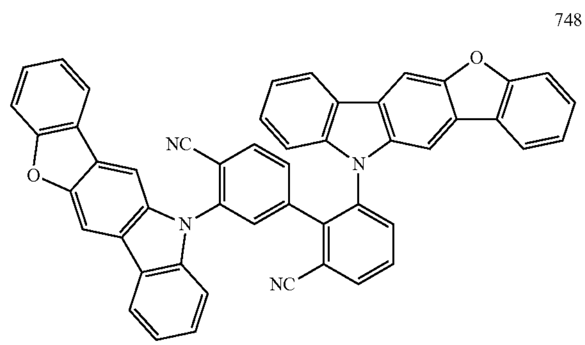
749
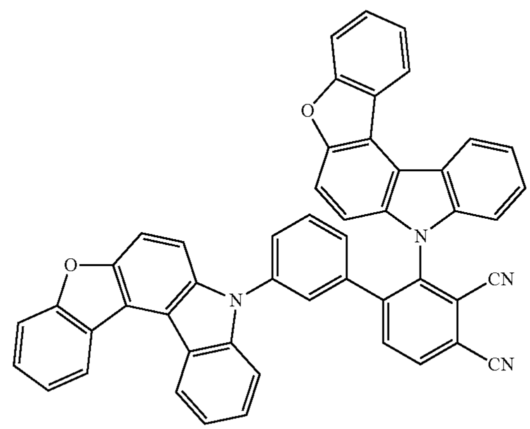
750
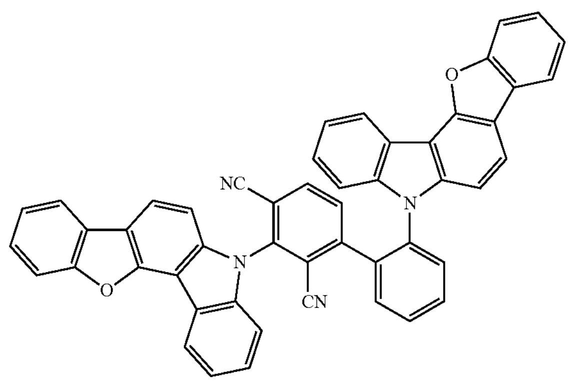
751
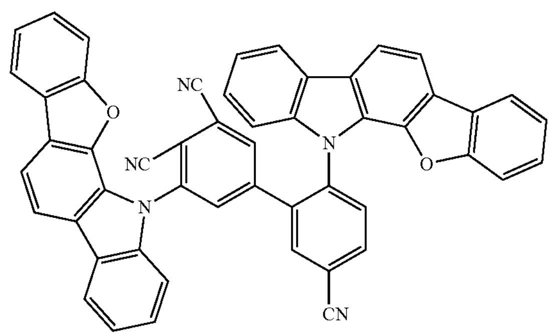
752
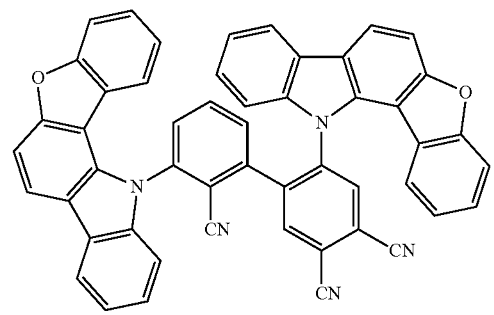

-continued
753
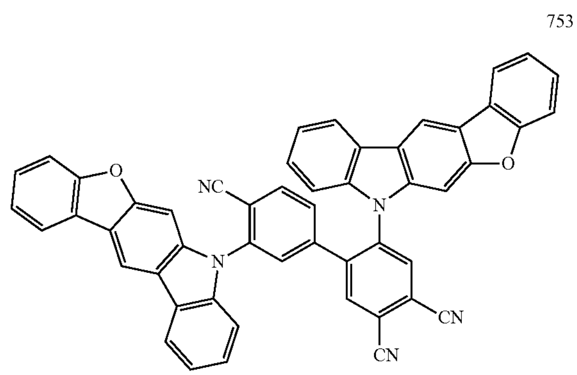
754
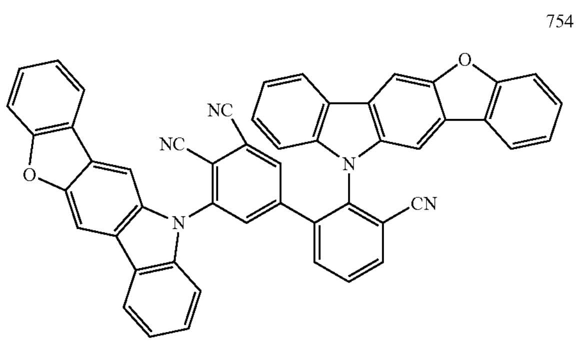
755
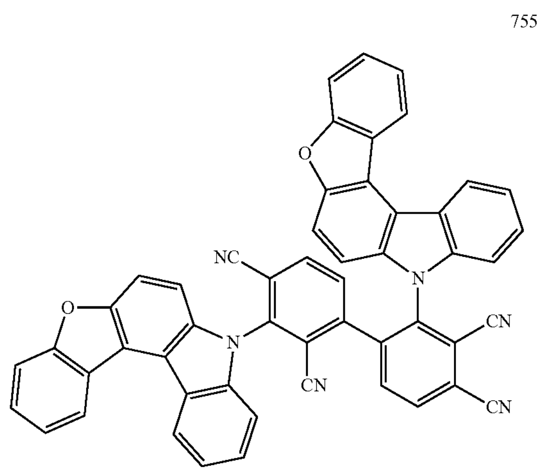
756
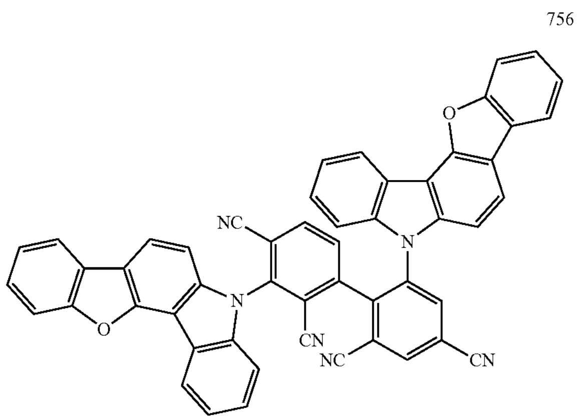
-continued
757
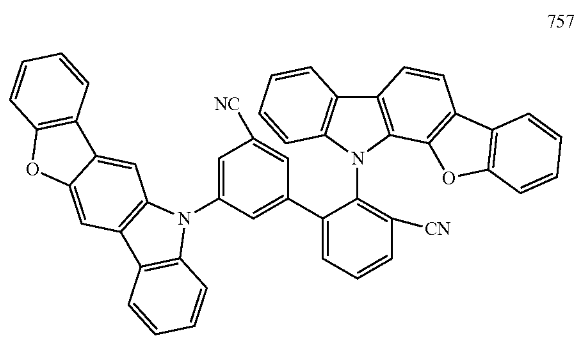
758
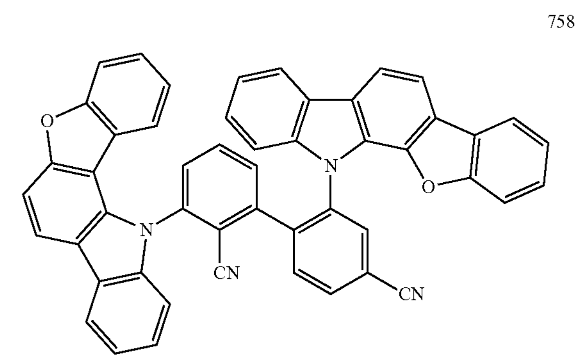
759
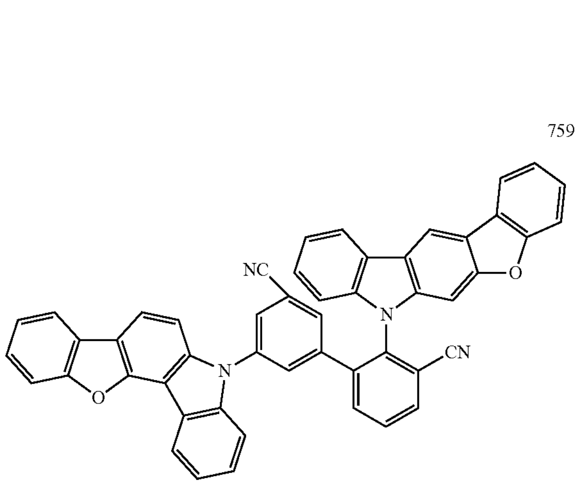
760
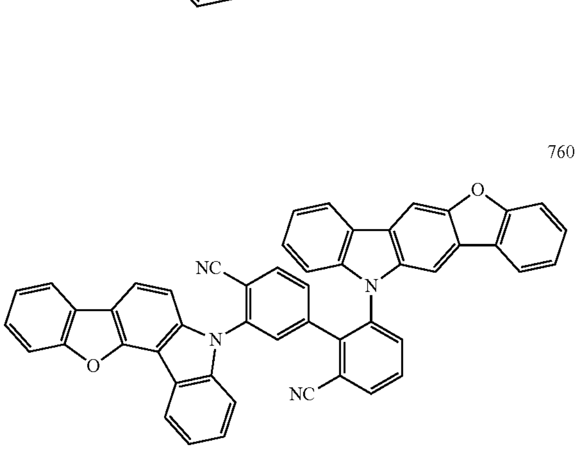

-continued
761
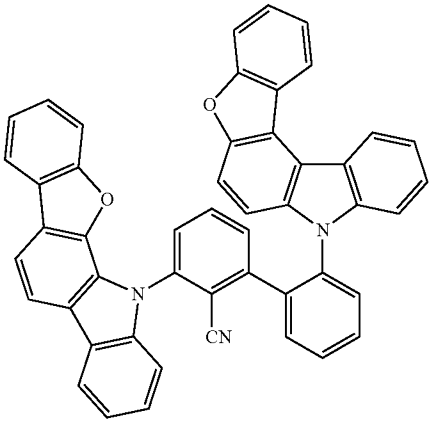
762
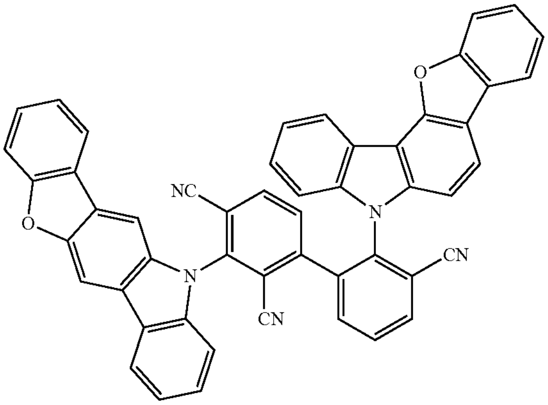
763
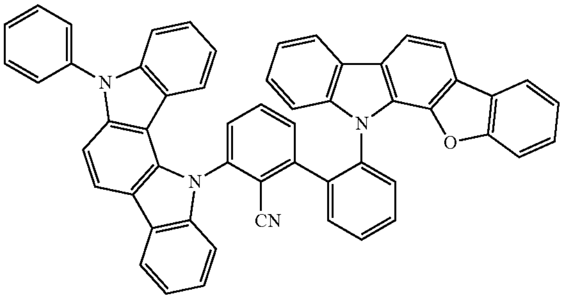
764
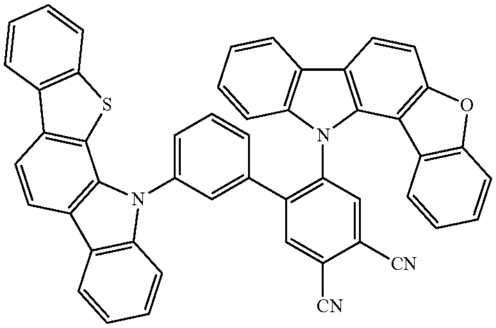
-continued
765
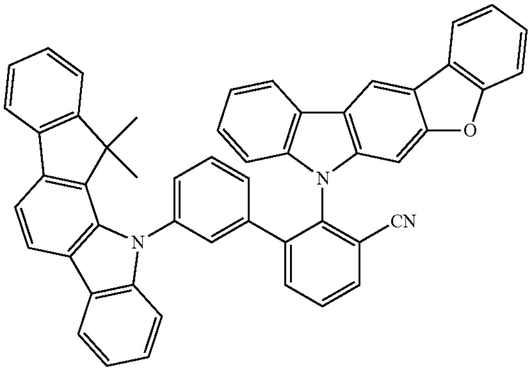
766
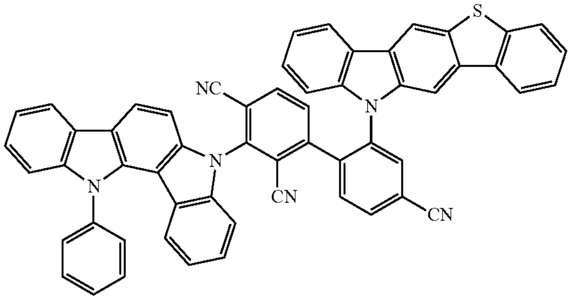
767
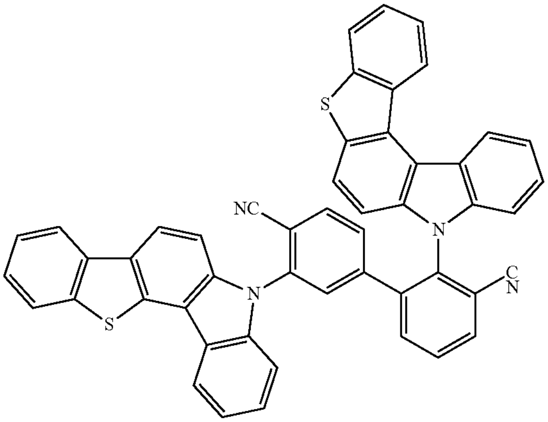
768
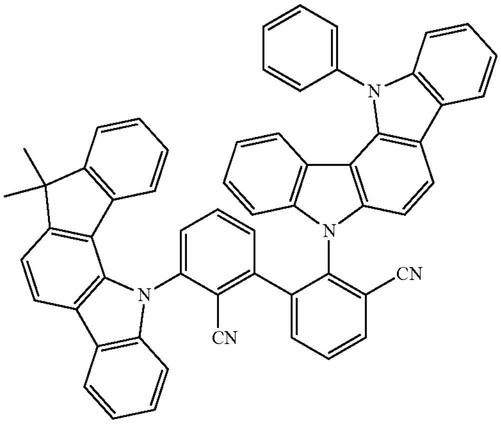

-continued
769
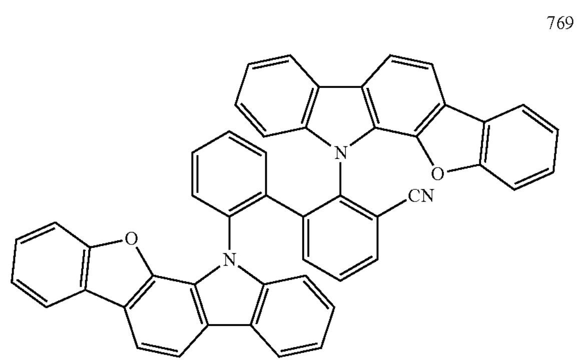
770
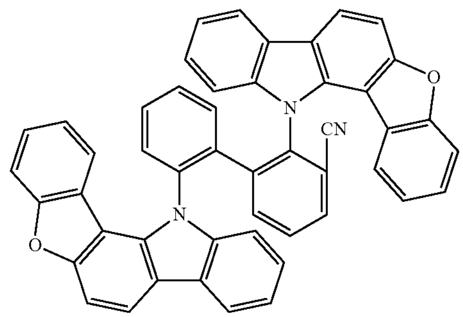
771
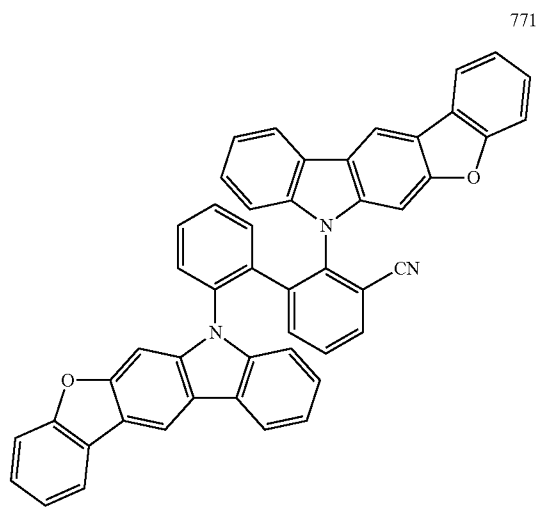
772
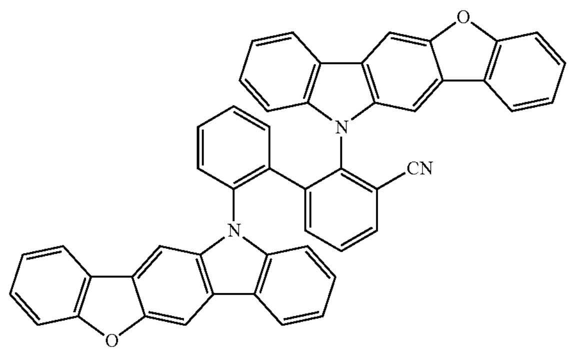
-continued
773
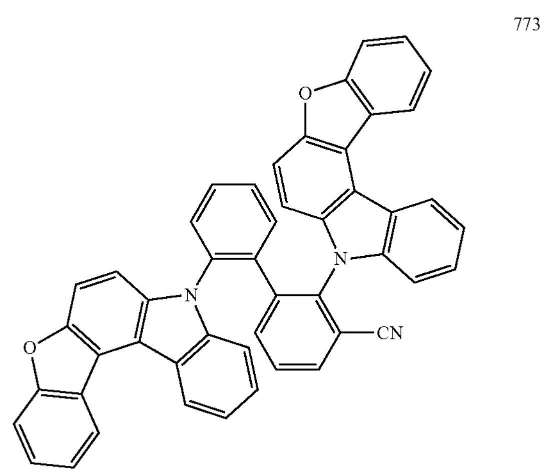
774
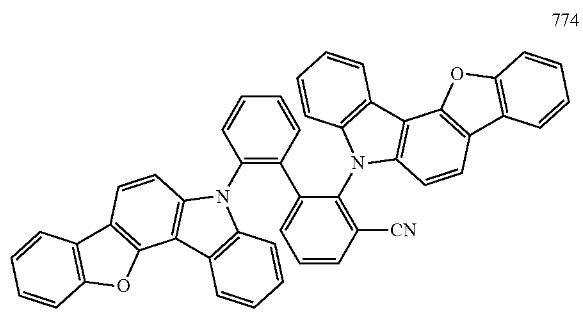
775
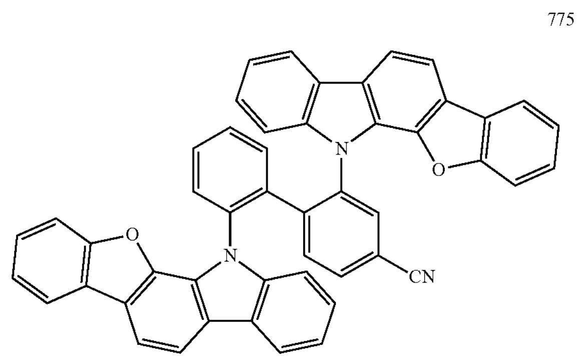
776
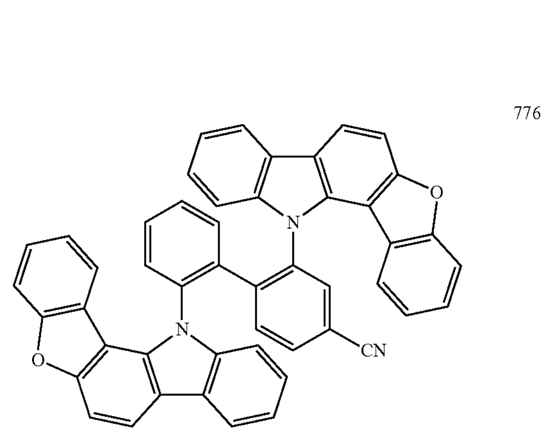

-continued
777
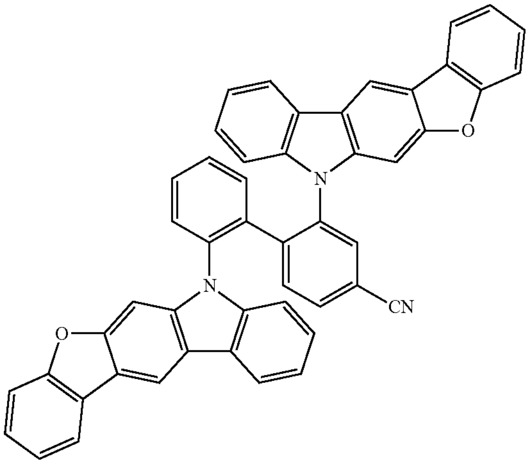
778
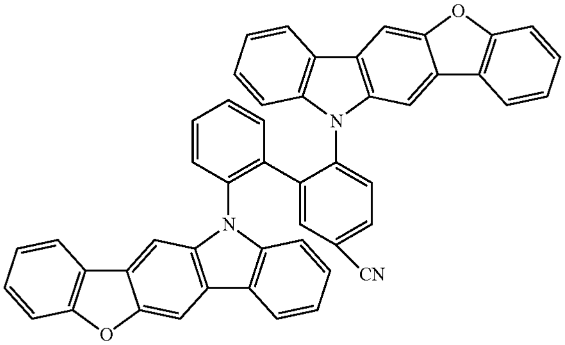
779
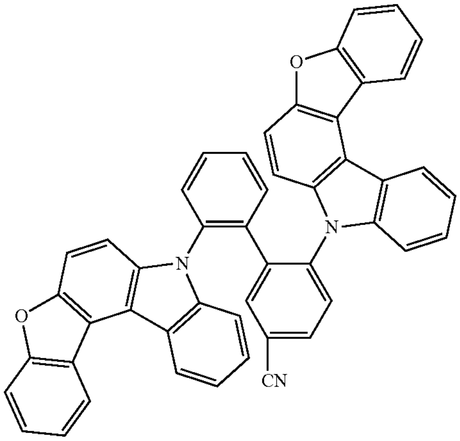
780
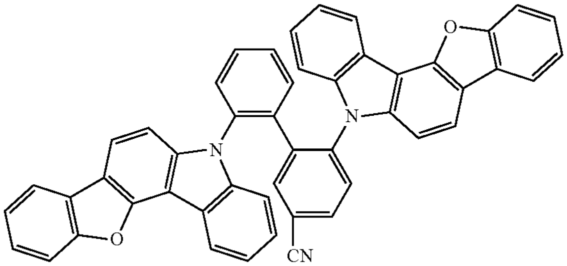
-continued
781
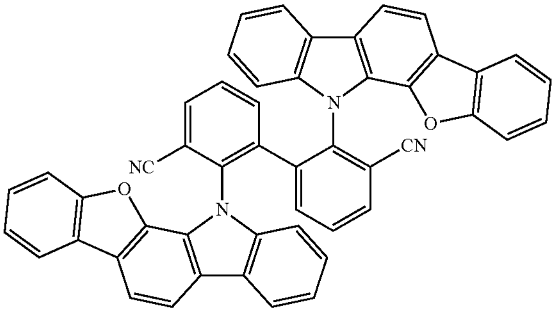
782
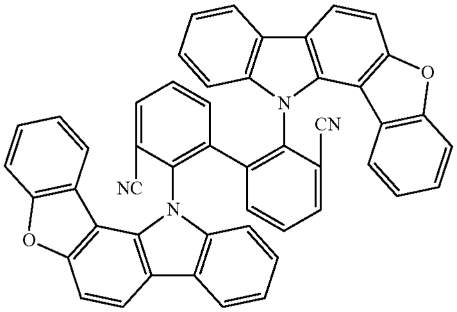
783
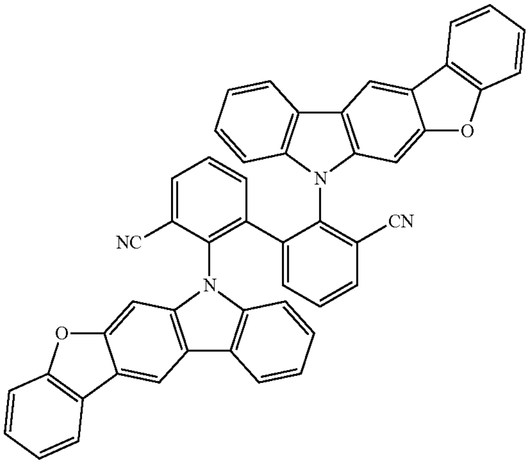
784
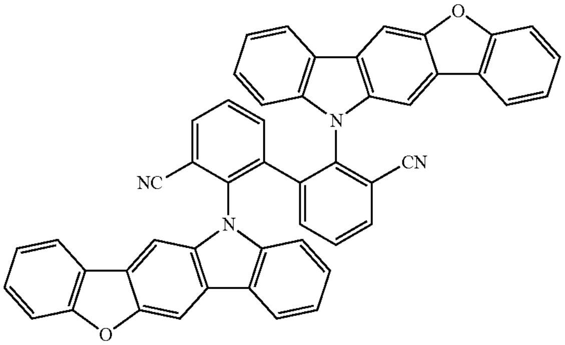

-continued
785
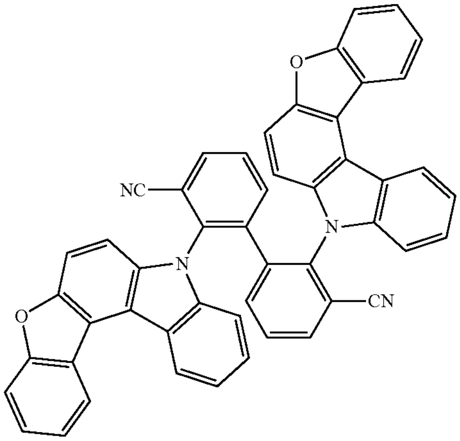
786
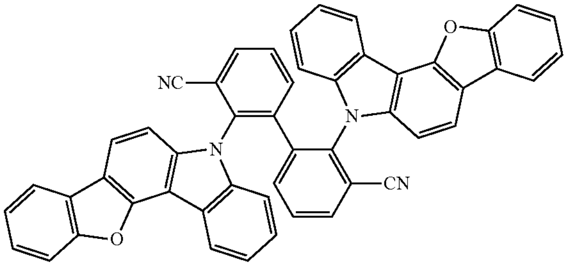
787
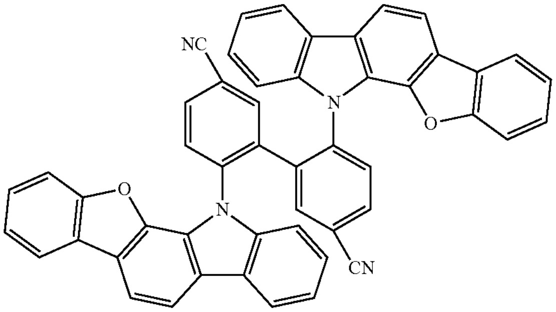
788
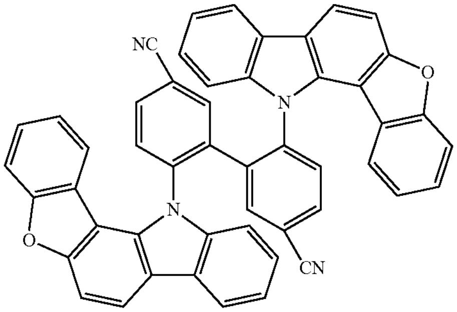
-continued
789
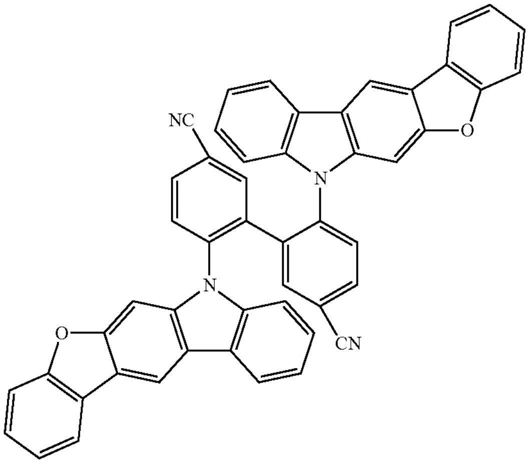
790
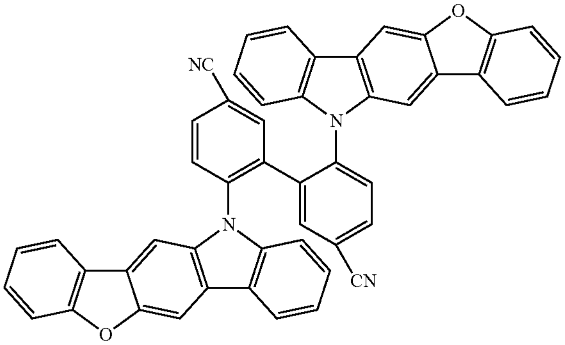
791
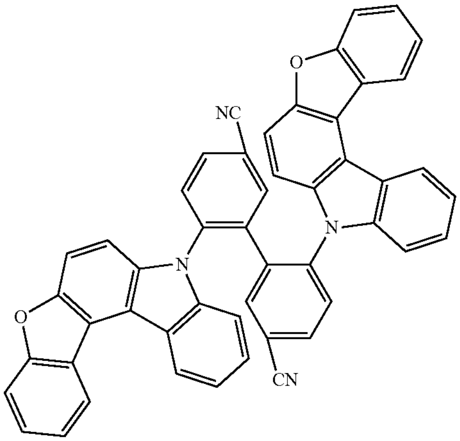
792
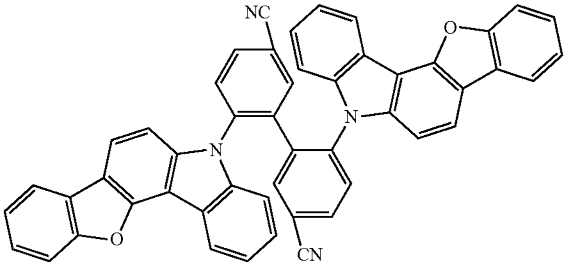

-continued
793
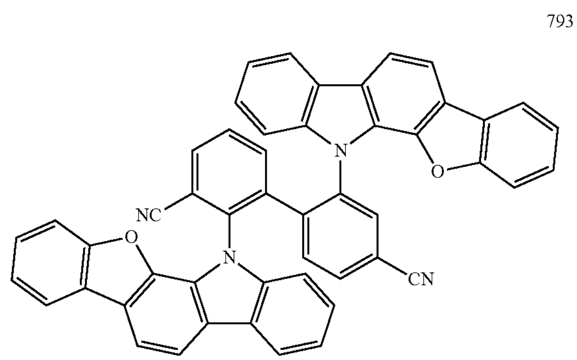
794
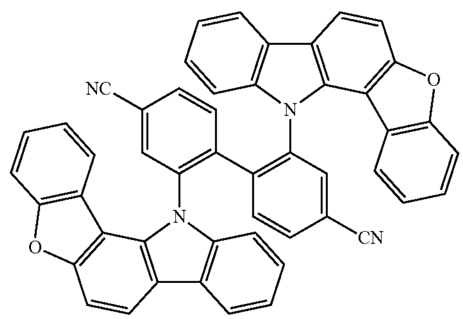
795
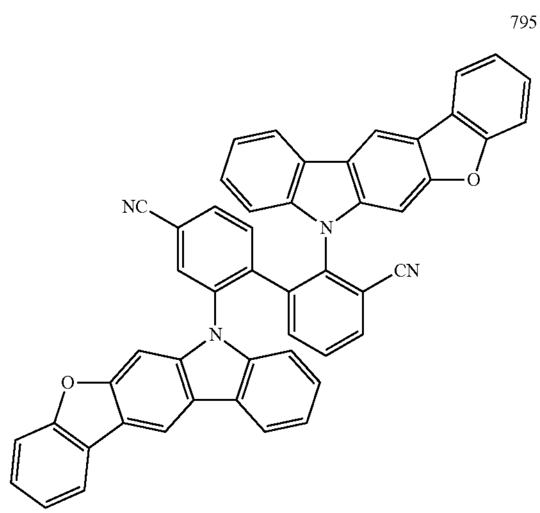
796
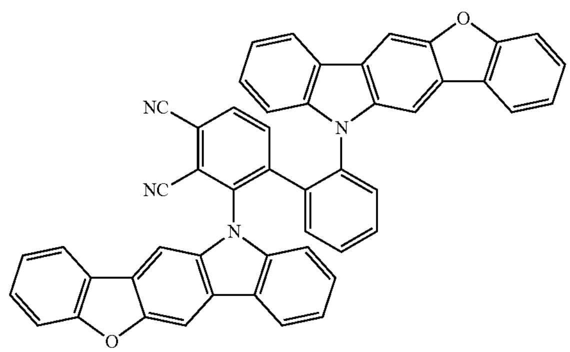
-continued
797
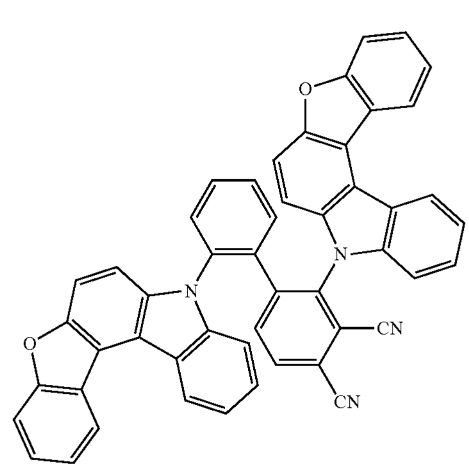
798
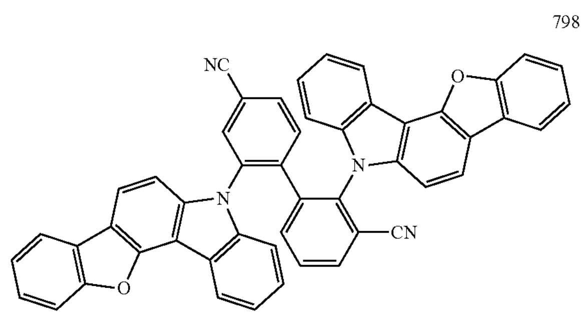
799
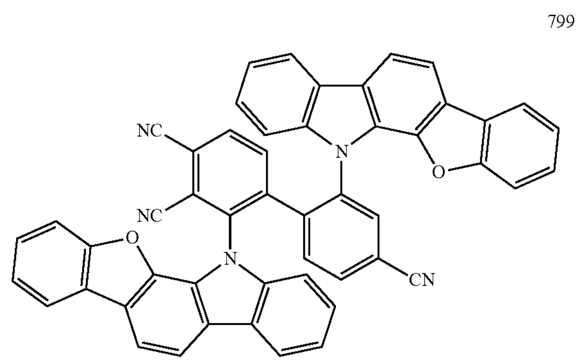
800
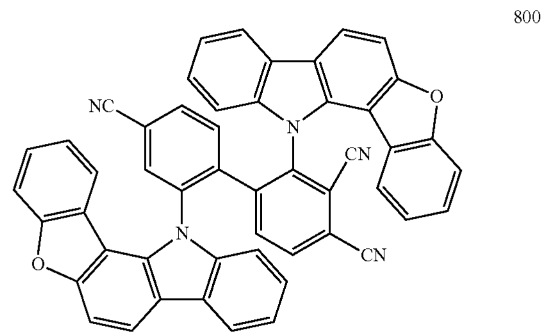

-continued
801
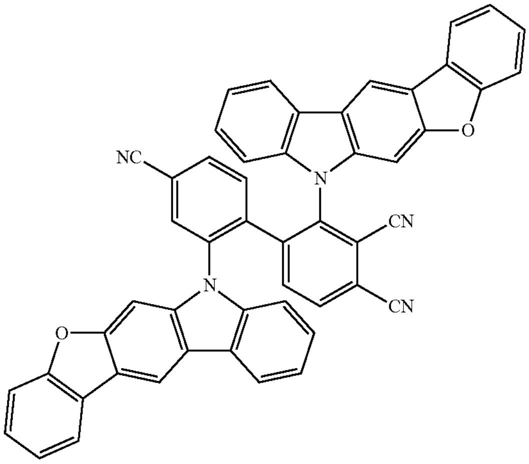
802
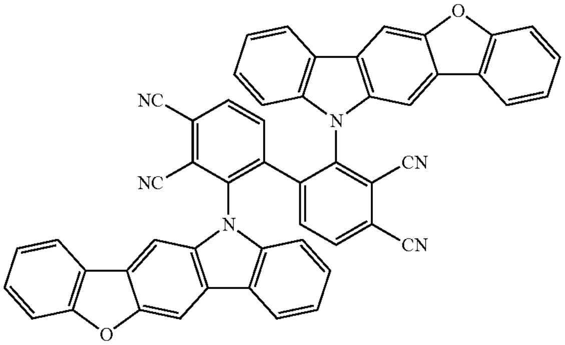
803
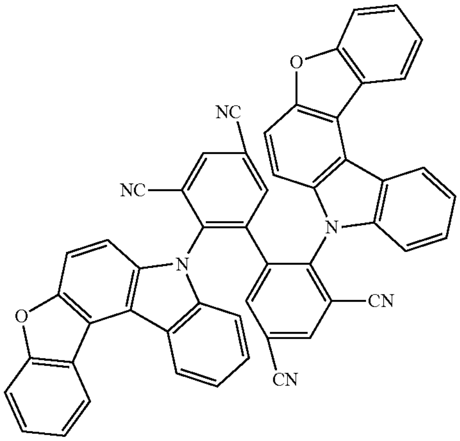
804
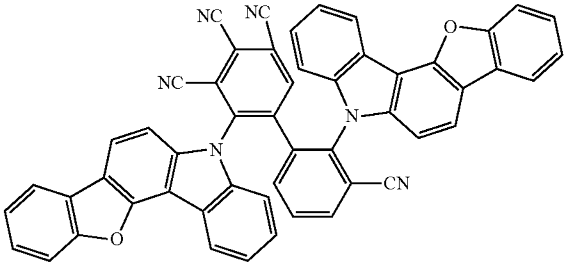
-continued
805
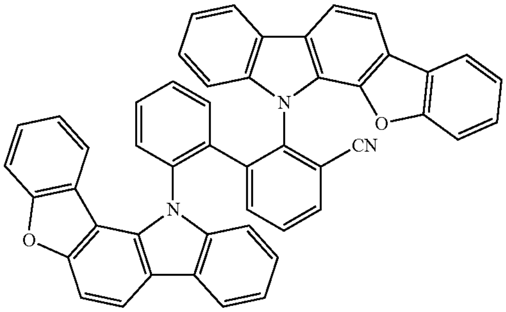
806
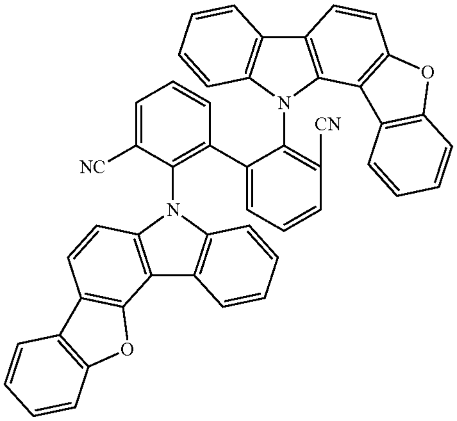
807
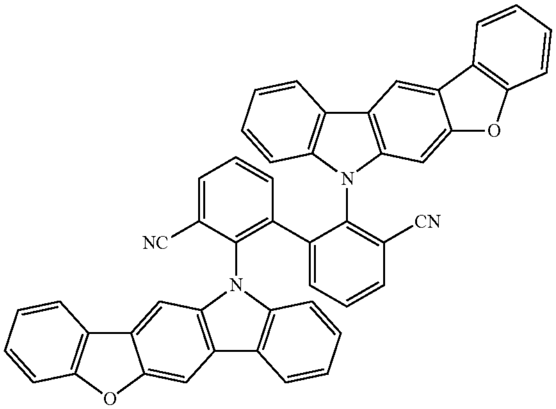
808
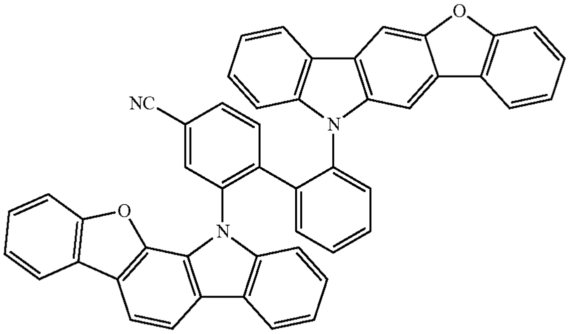

-continued
809
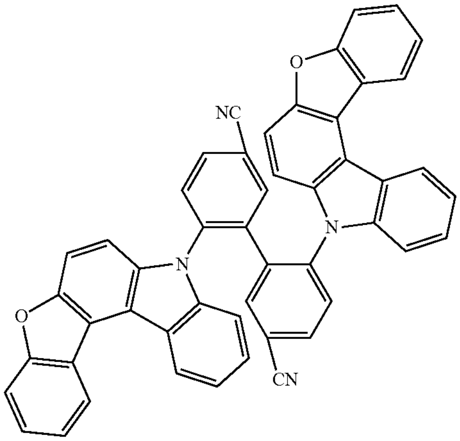
810
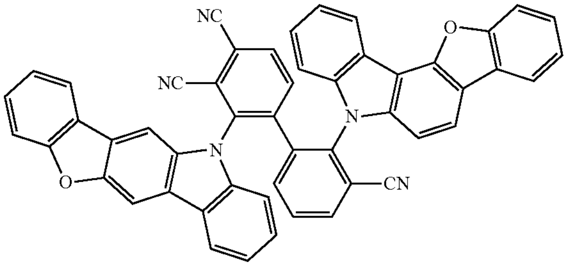
811
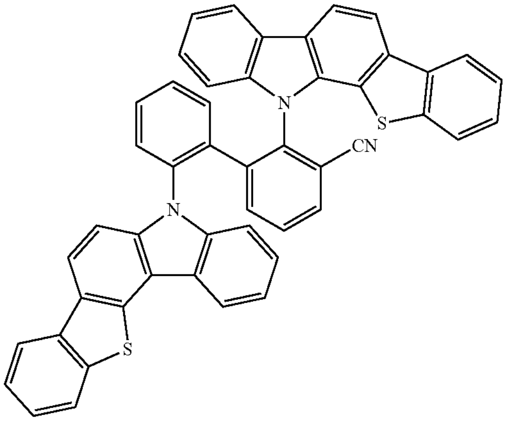
812
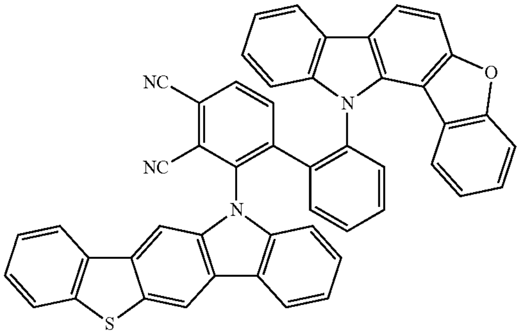
-continued
813
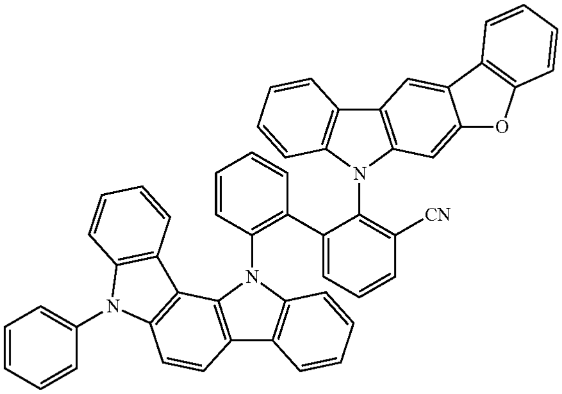
814
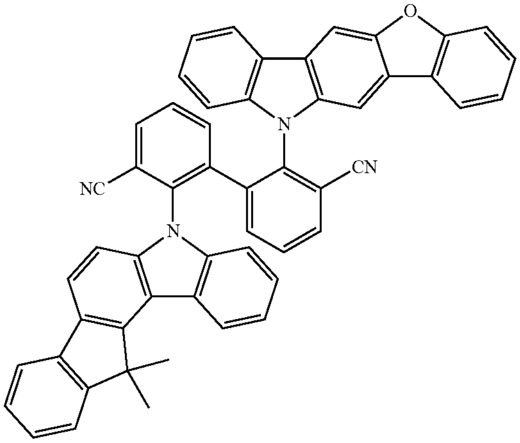
815
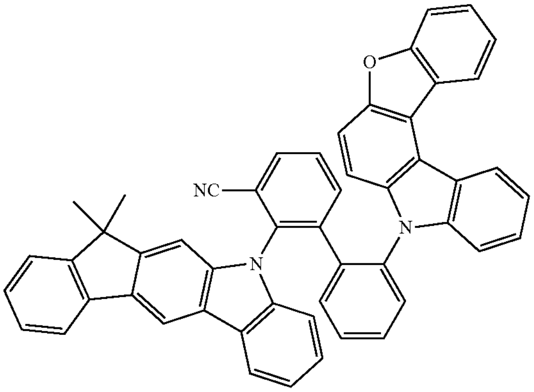
816
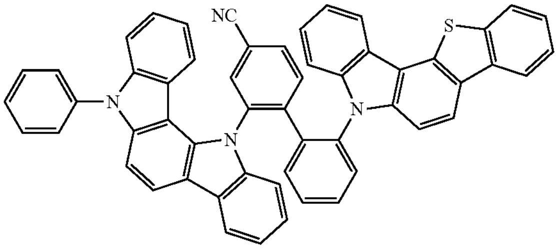

-continued
817
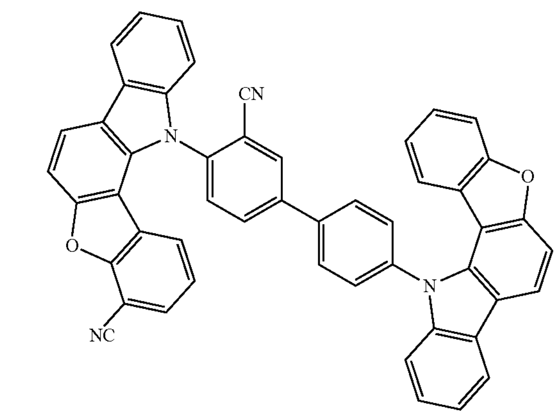
818
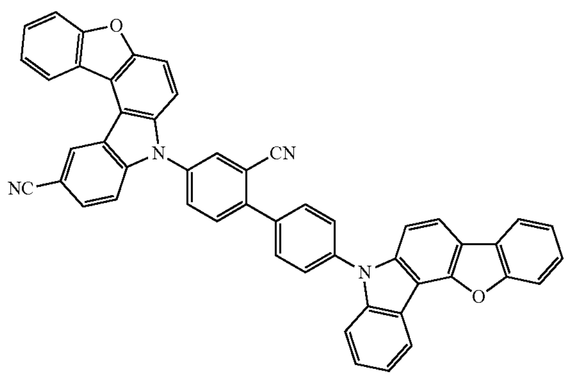
819
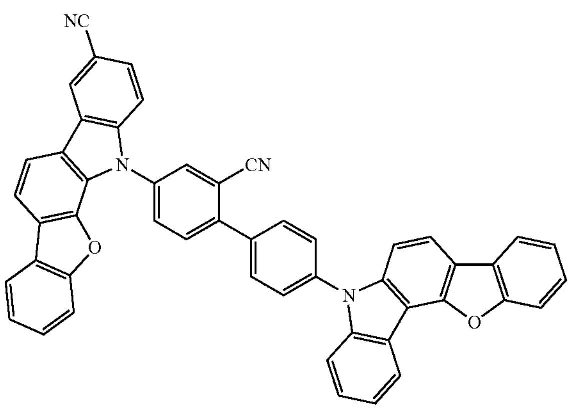
820
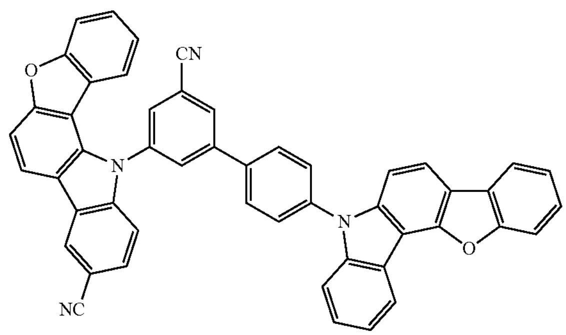
-continued
821
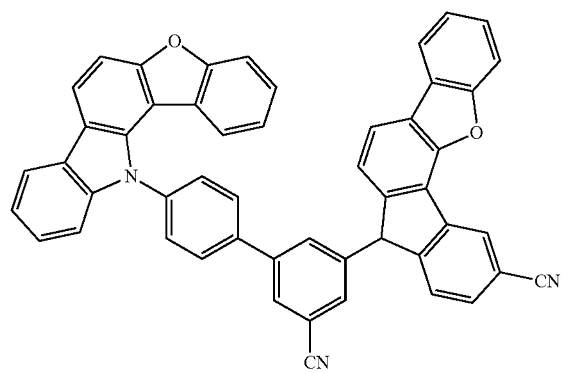
822
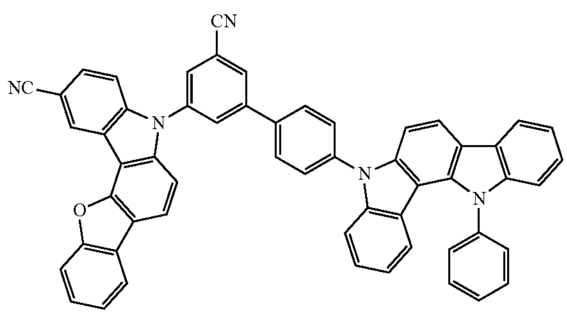
823
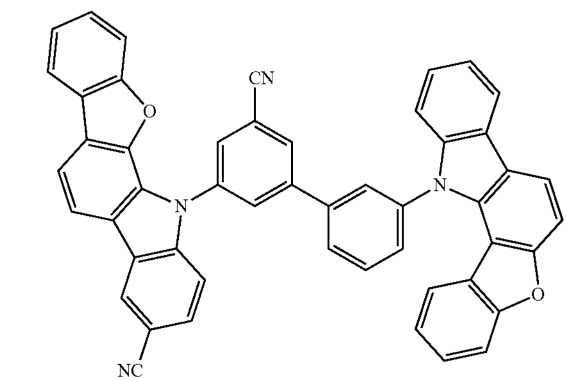
824
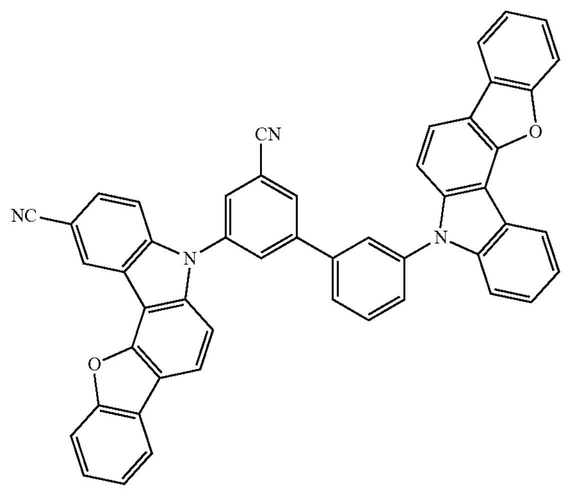

-continued
825
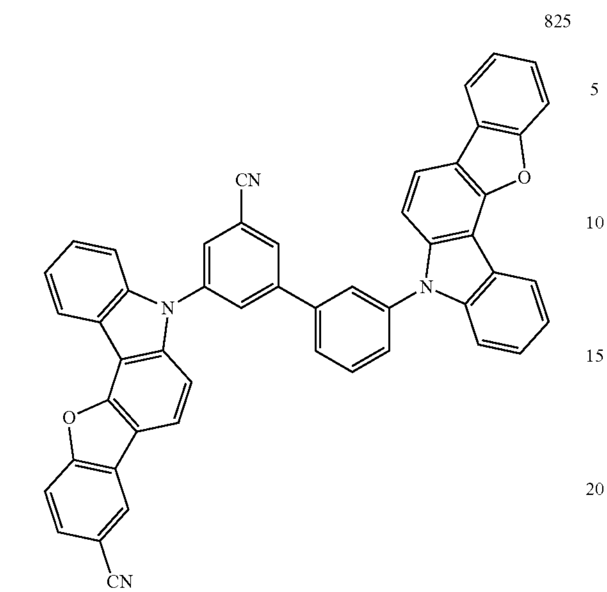
826
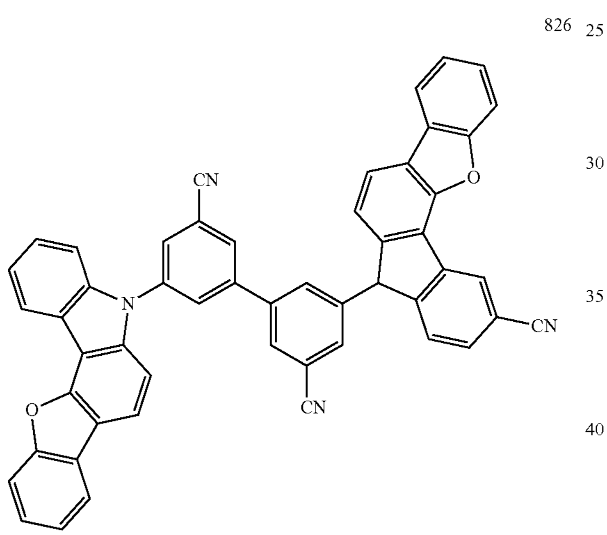
827
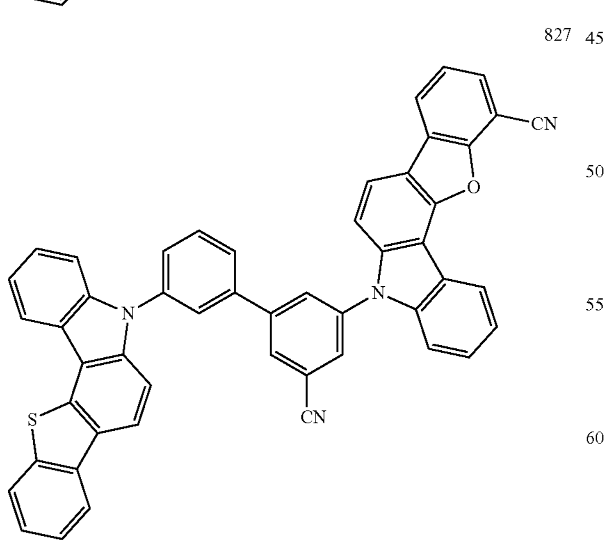
-continued
828
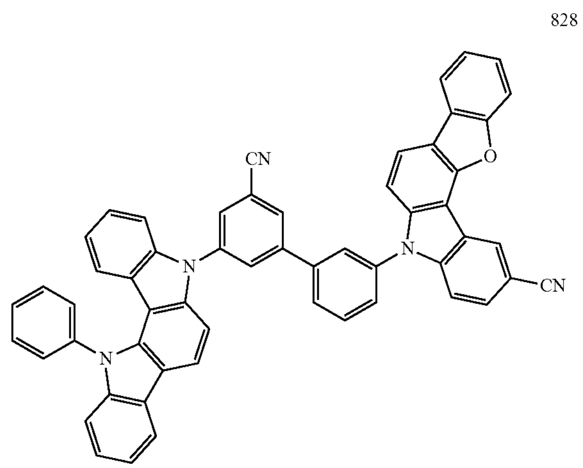
829
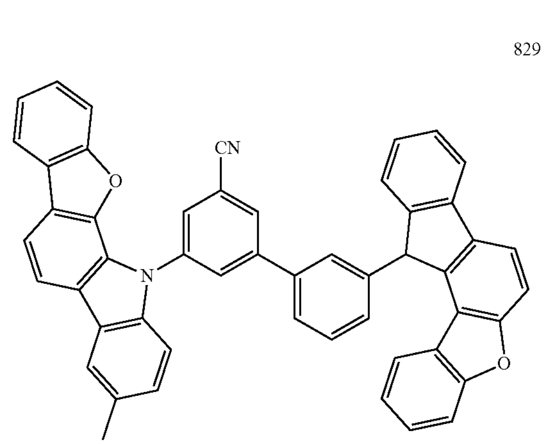
830
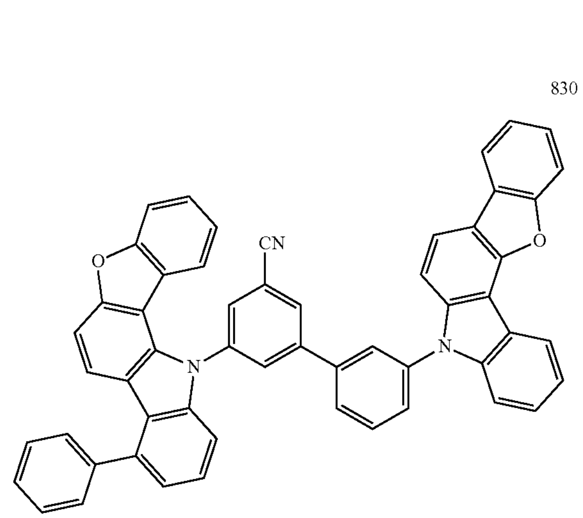

-continued
831
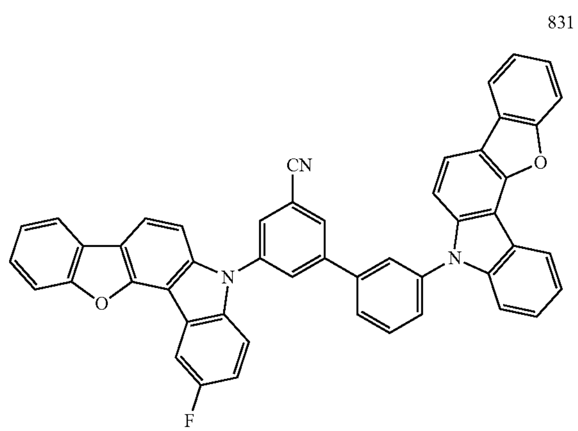
832
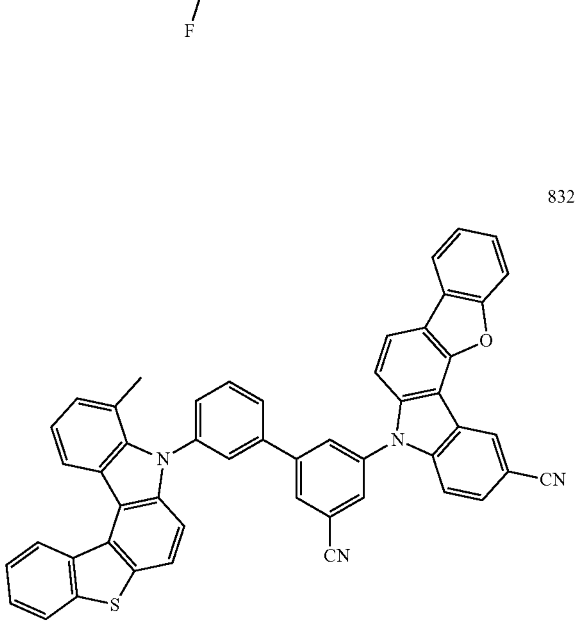
833
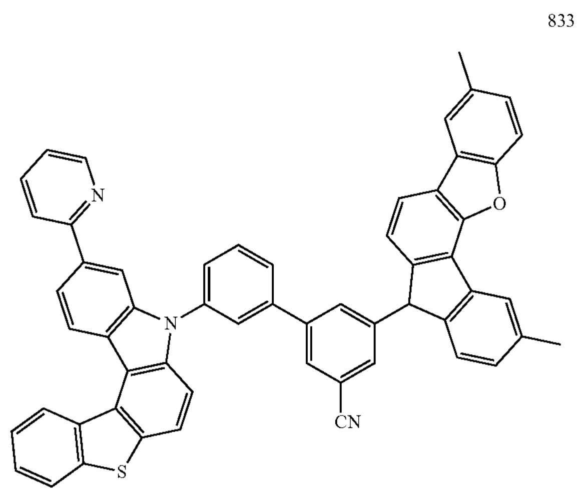
-continued
834
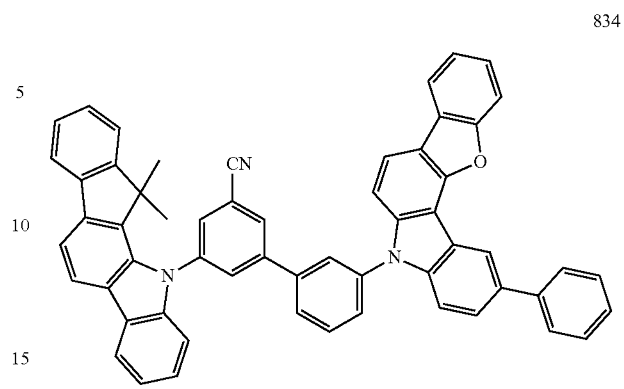
835
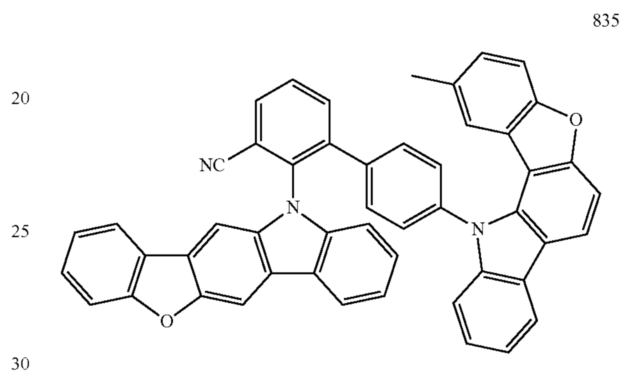
836
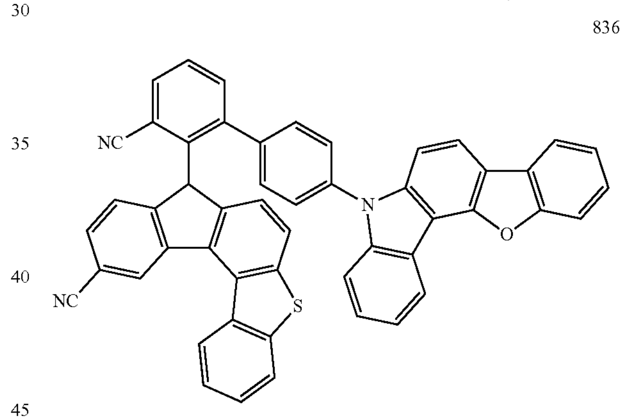
837
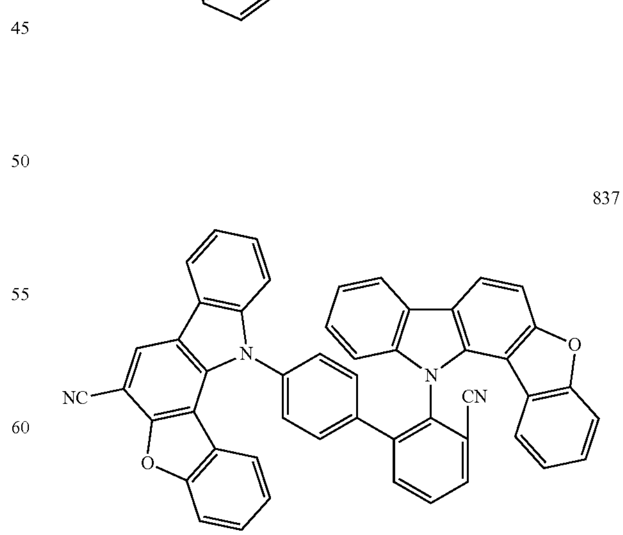

-continued
838
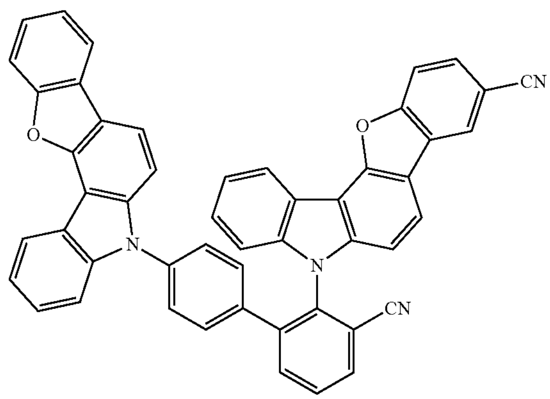
839
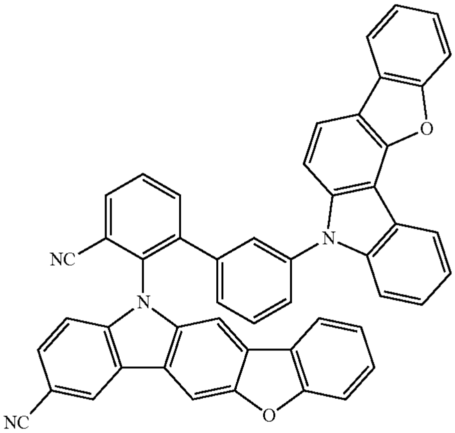
840
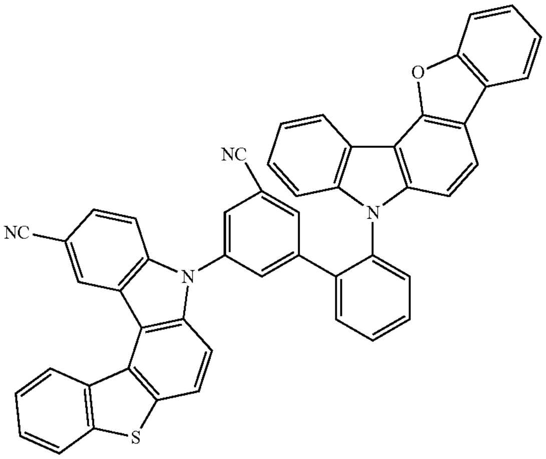
-continued
841
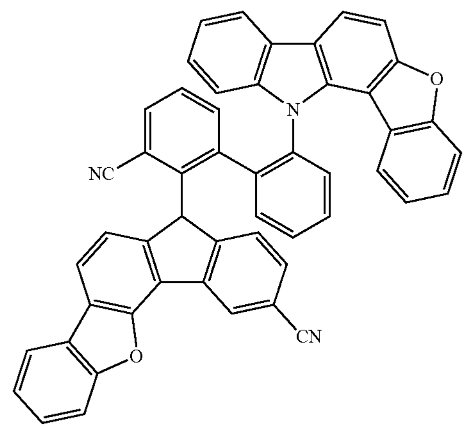
842
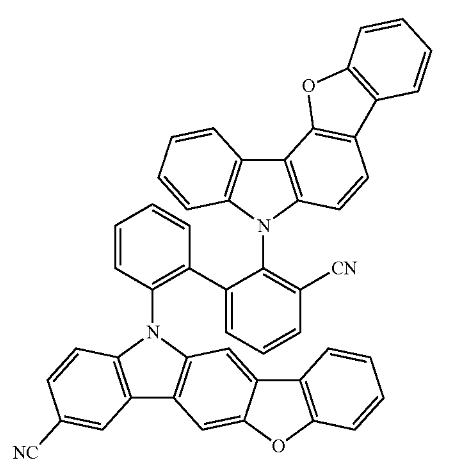
843
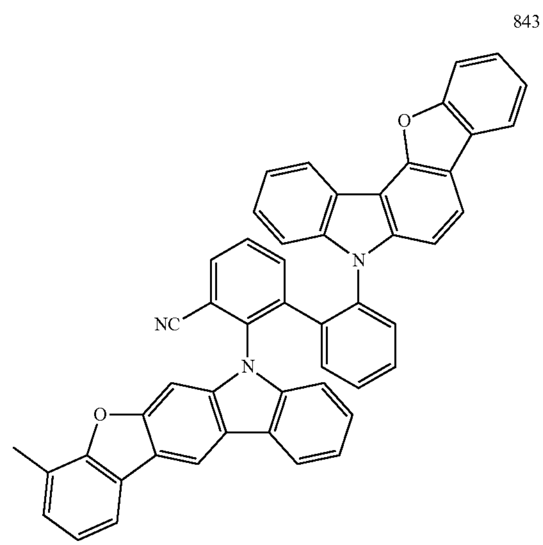

-continued
844
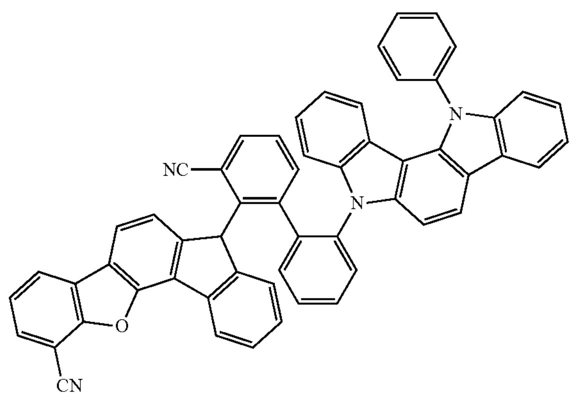
845
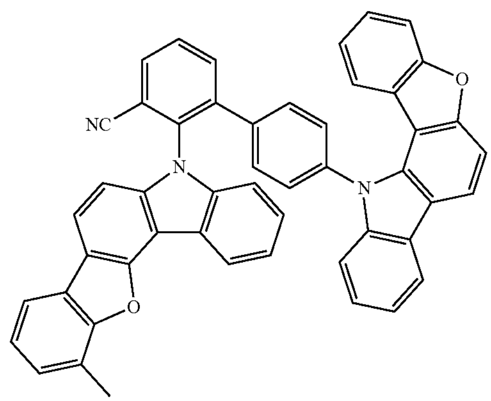
846
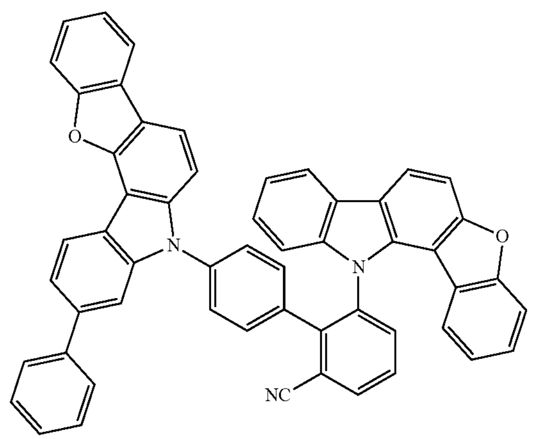
847
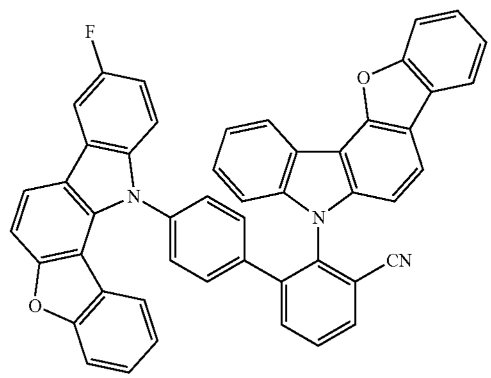
-continued
848
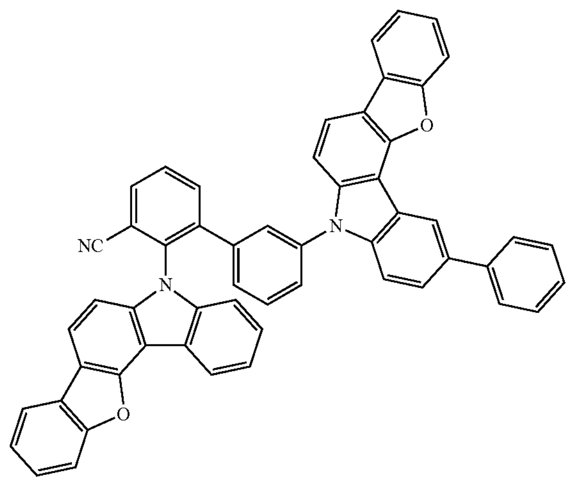
849
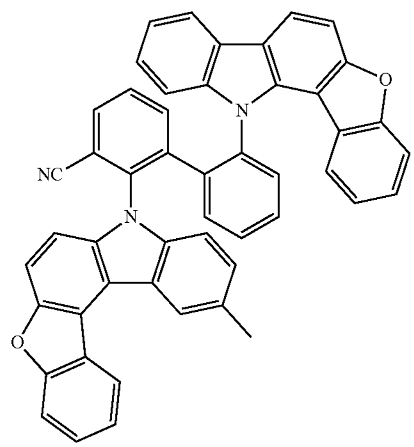
850
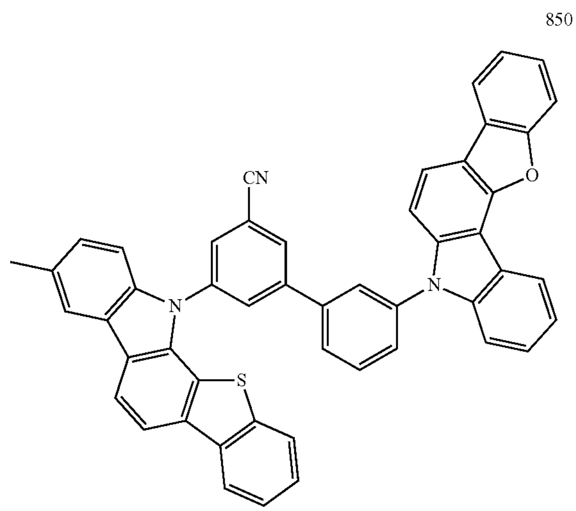

-continued
851
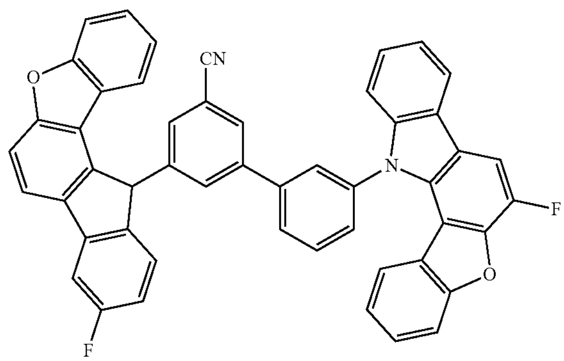
852
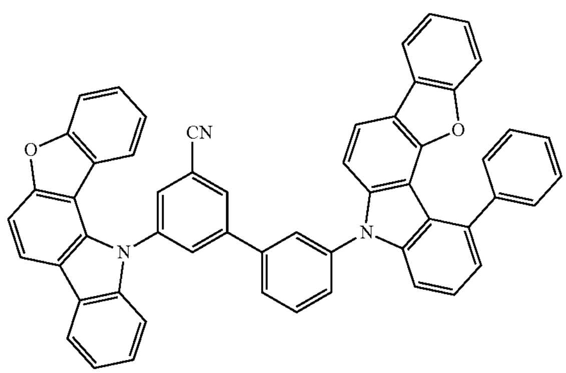
1
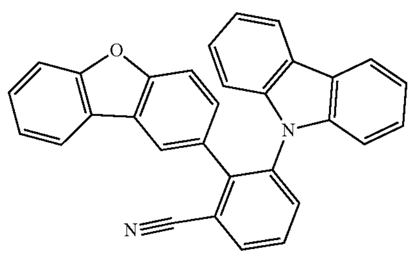
2
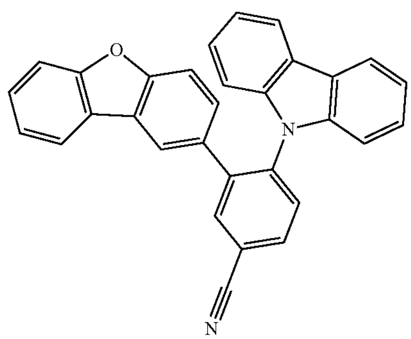
-continued
3
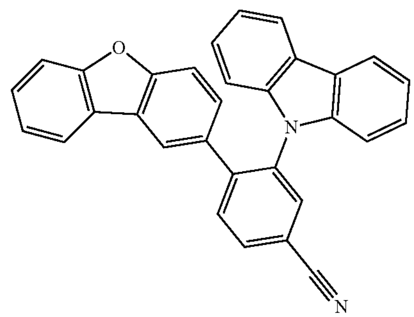
4
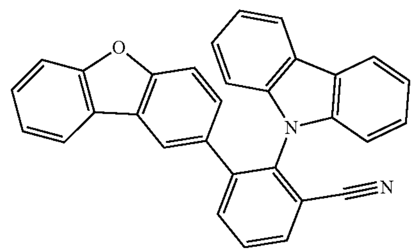
5
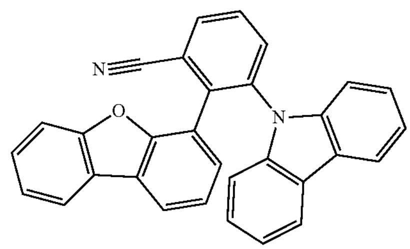
6
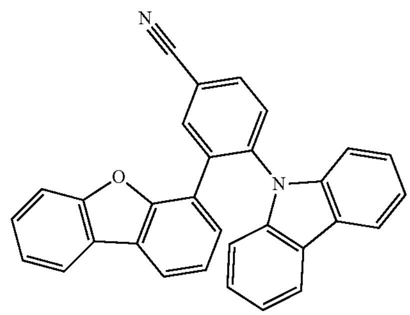
7
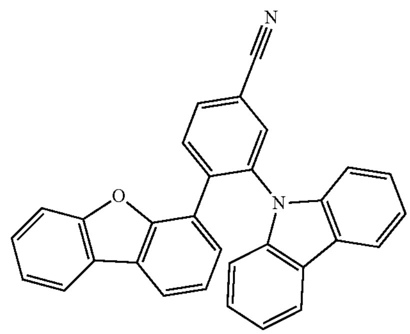

-continued
8
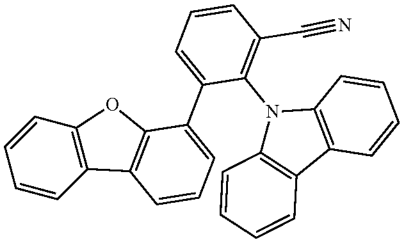
9
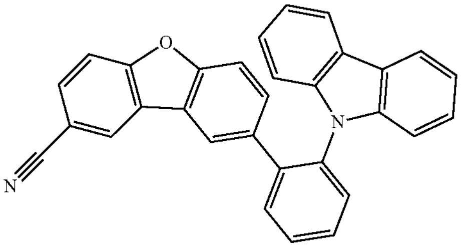
10
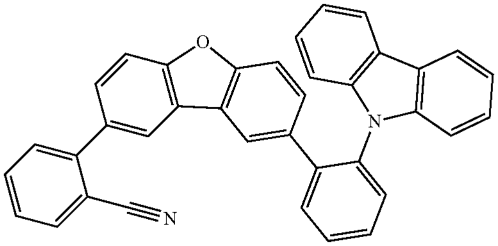
11
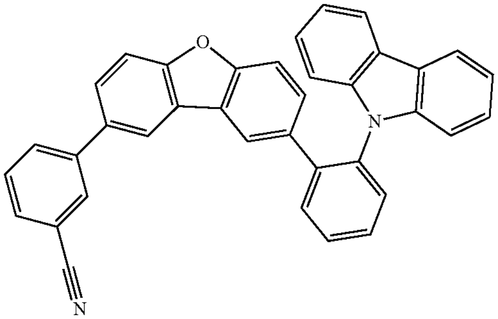
12
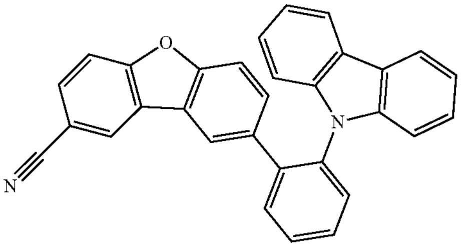
13
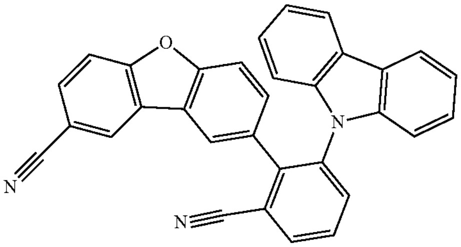
-continued
14
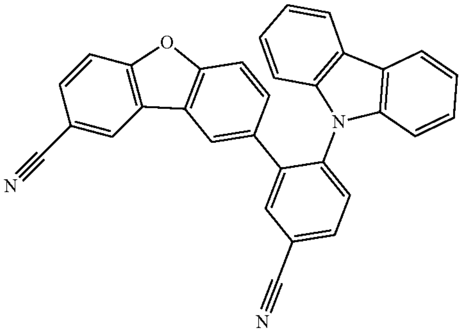
15
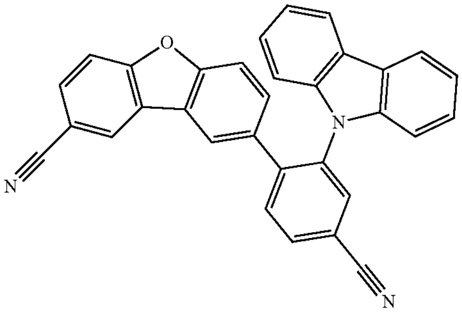
16
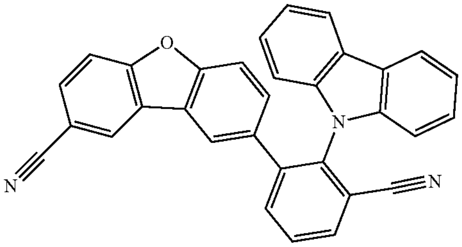
17
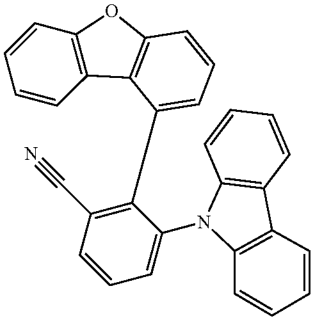
18
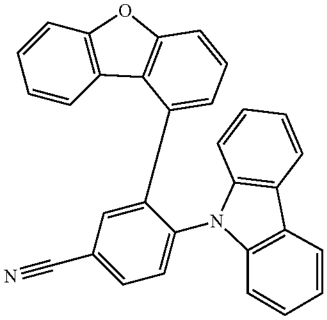

-continued
19
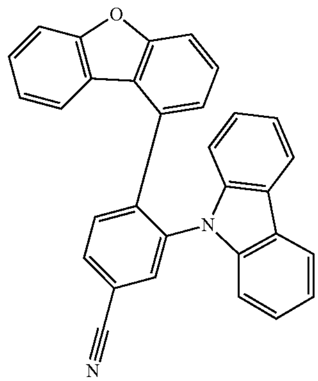
20
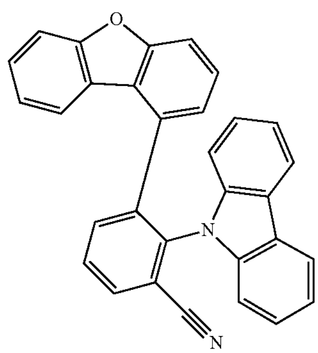
21
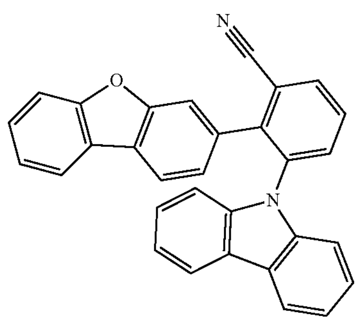
22
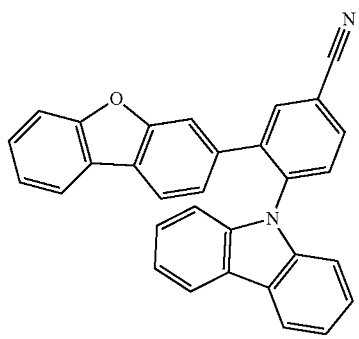
23
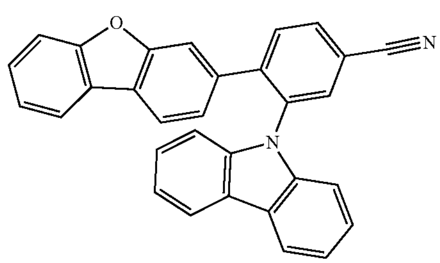
-continued
24
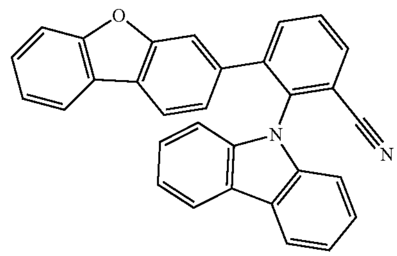
25
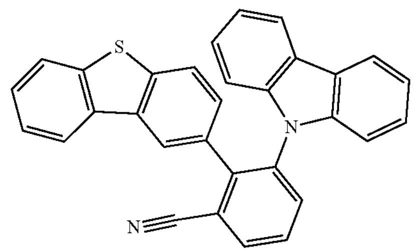
26
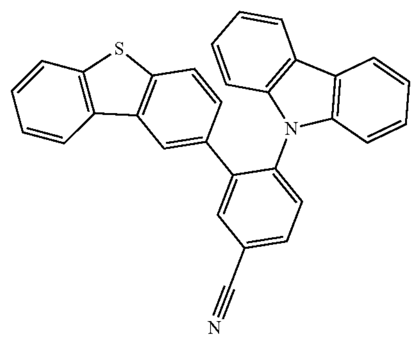
27
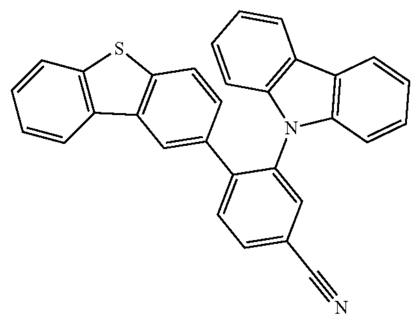
28
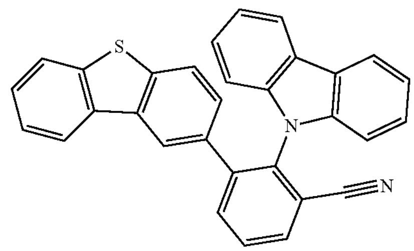

-continued
29
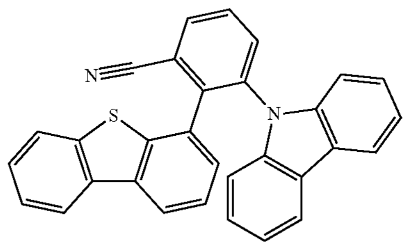
30
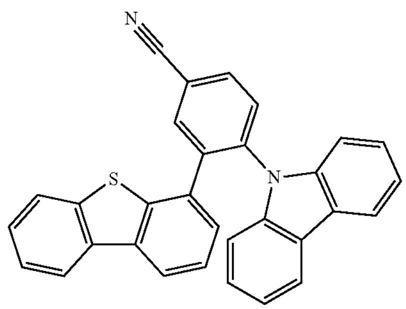
31
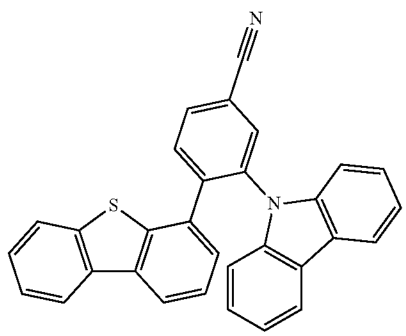
32
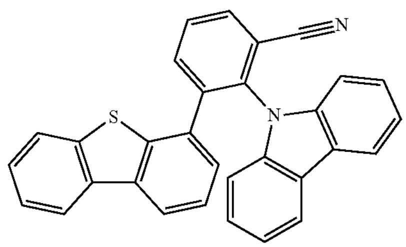
33
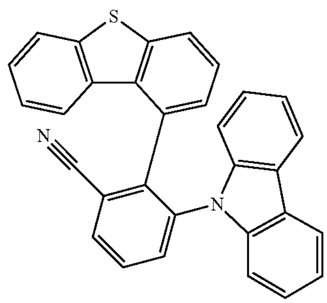
-continued
34
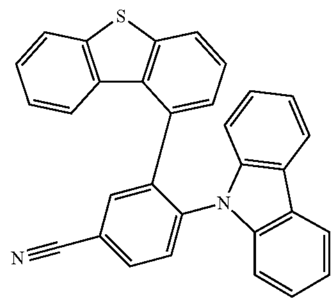
35
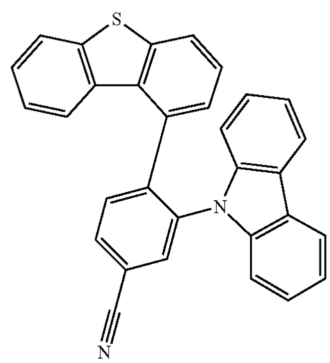
36
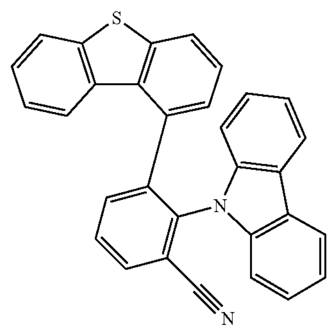
37
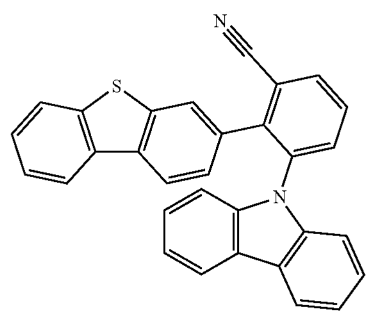
38
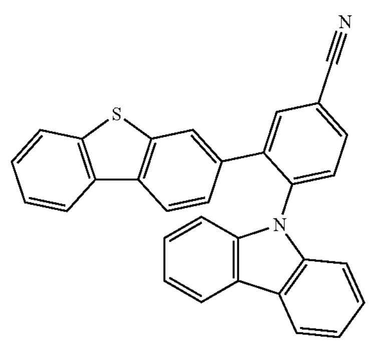

-continued
39
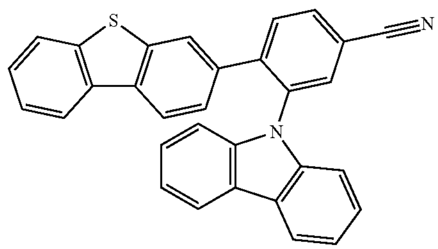
40
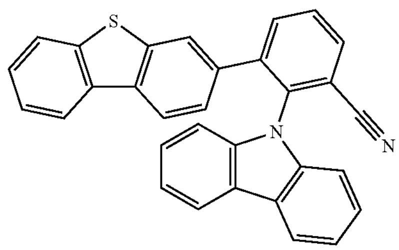
41
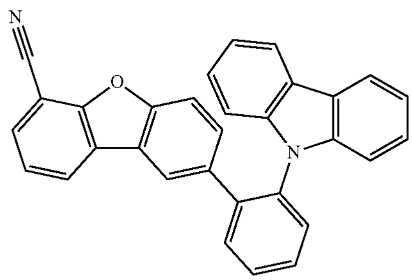
42
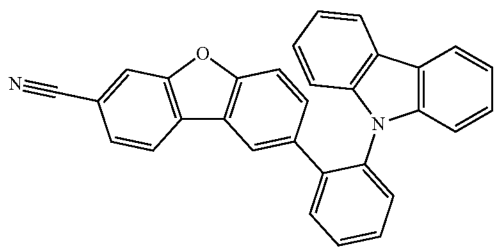
43
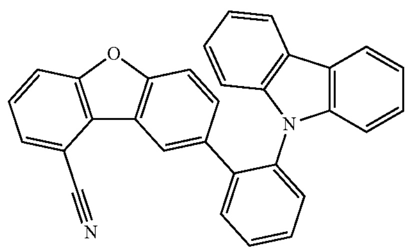
44
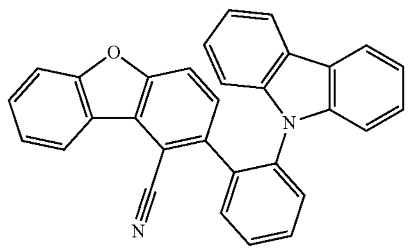
-continued
45
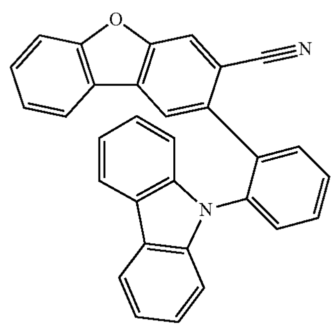
46
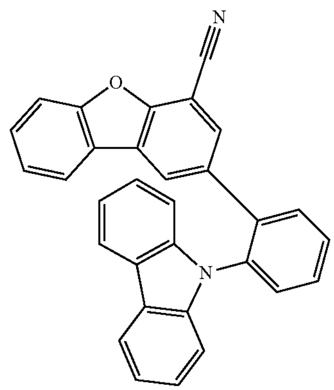
47
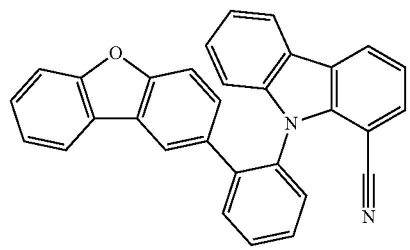
48
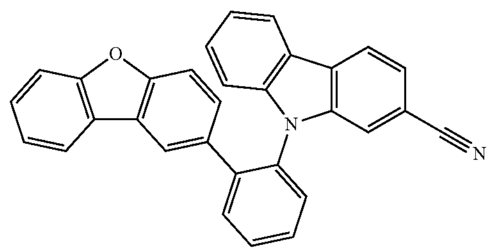
49
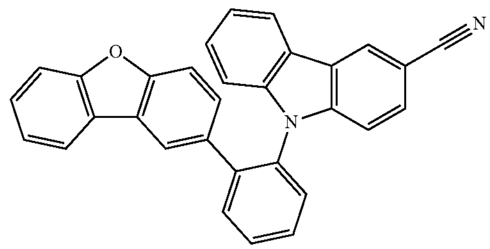

-continued
50
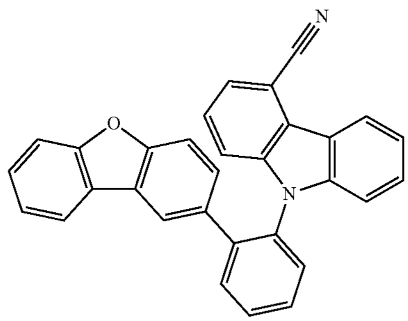
51
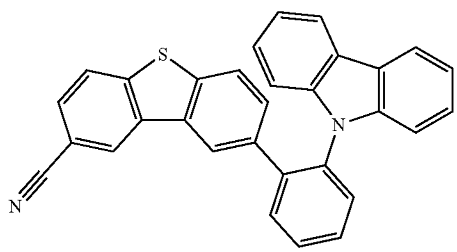
52
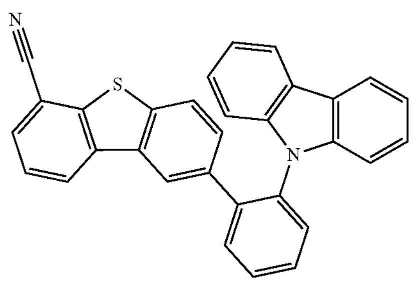
53
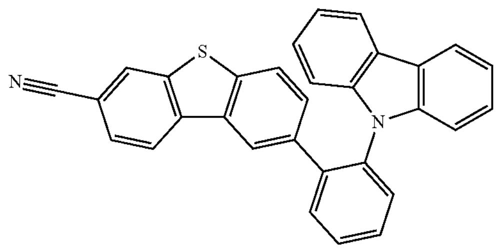
54
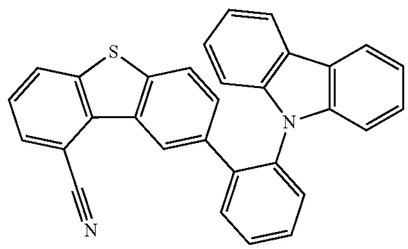
55
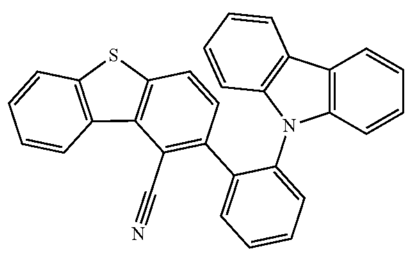
-continued
56
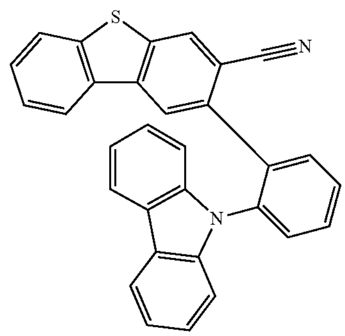
57
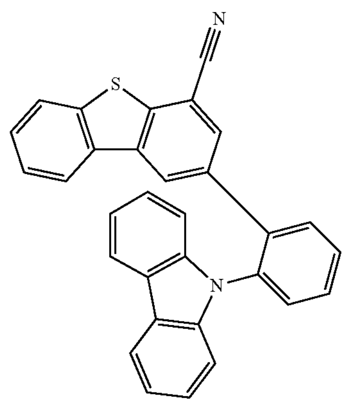
58
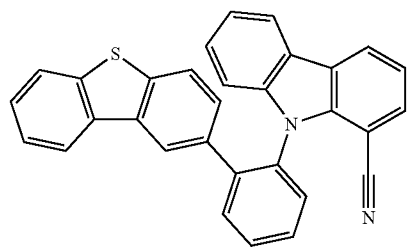
59
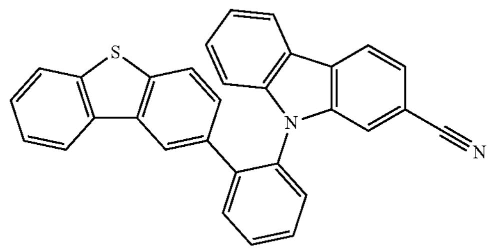
60
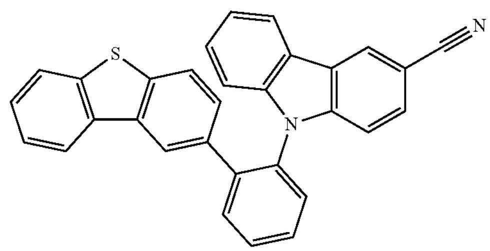

-continued
61
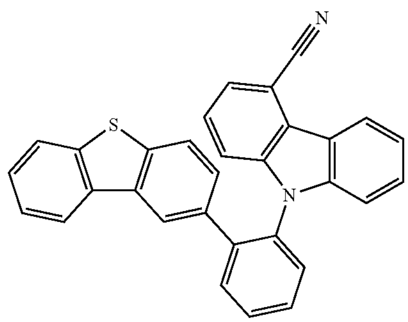
62
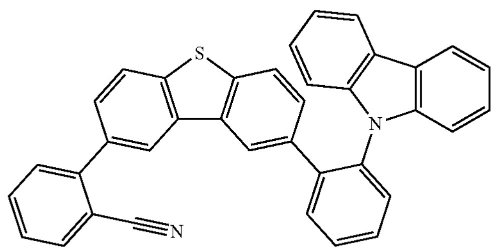
63
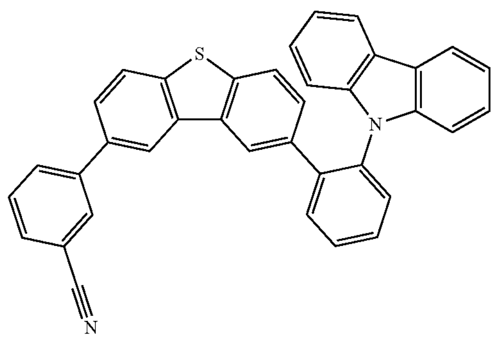
64
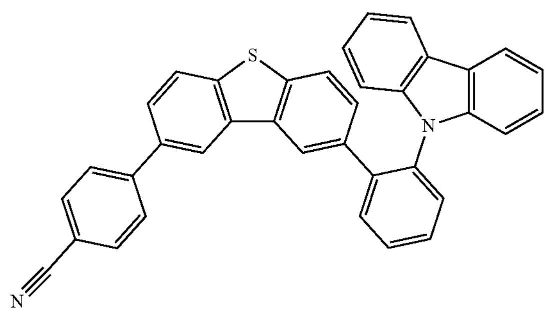
65
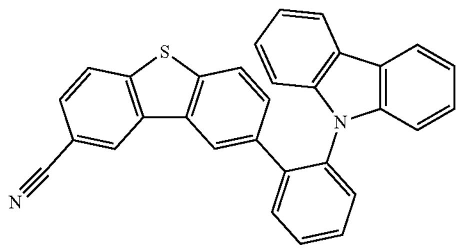
-continued
66
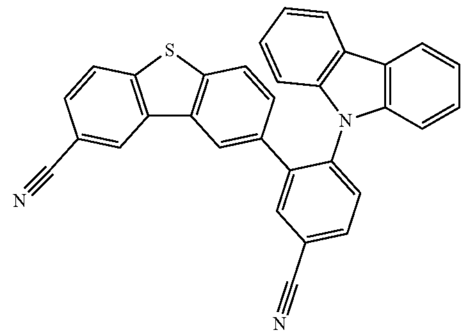
67
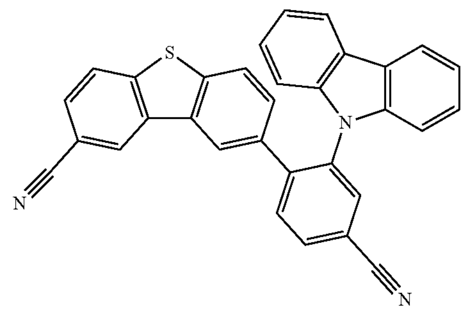
68
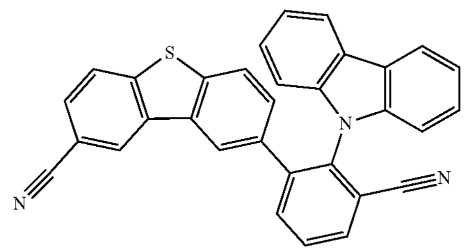
69
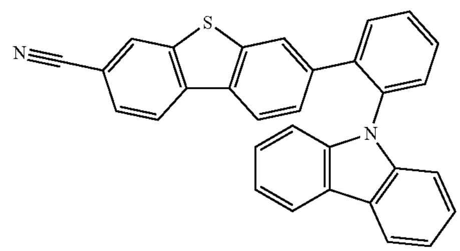
70
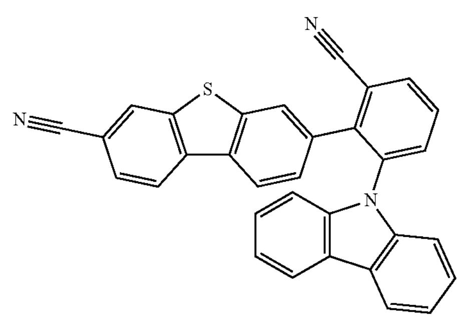

-continued
71
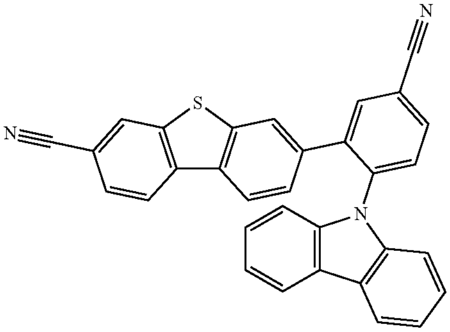
72
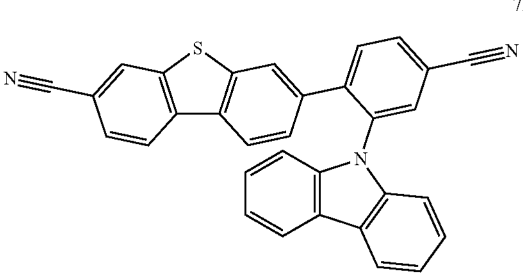
73
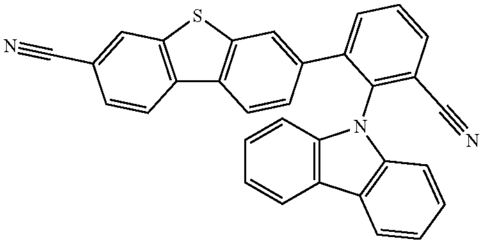
74
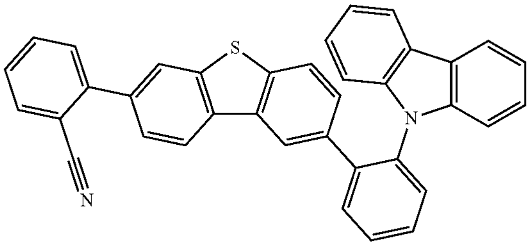
75
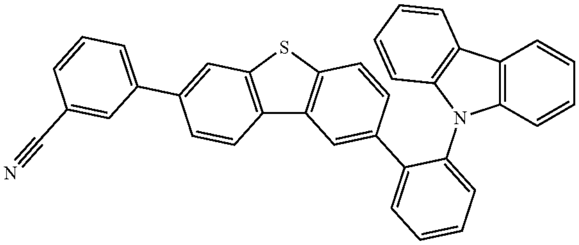
-continued
76
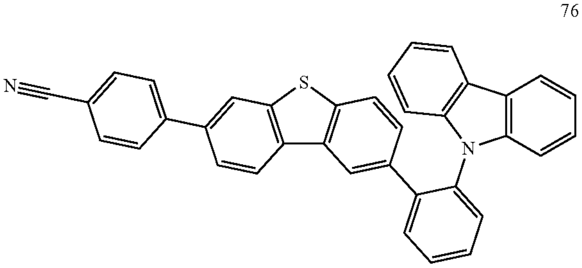
77
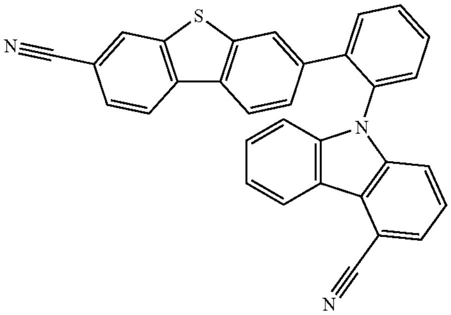
78
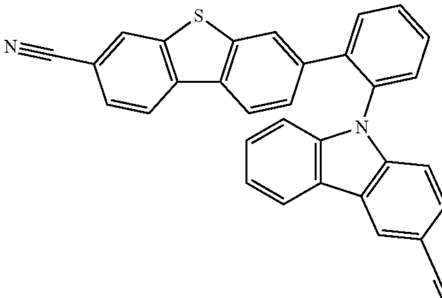
79
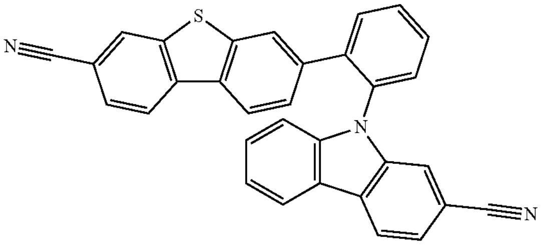
80
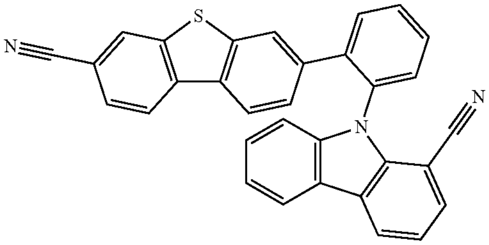

81
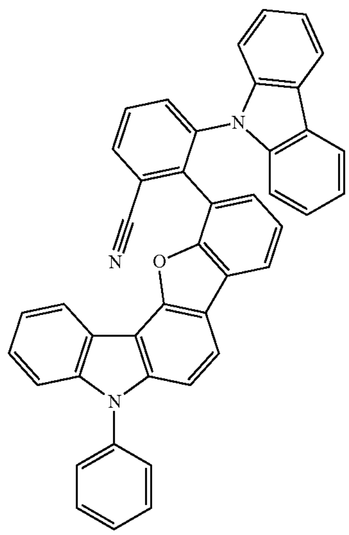
82
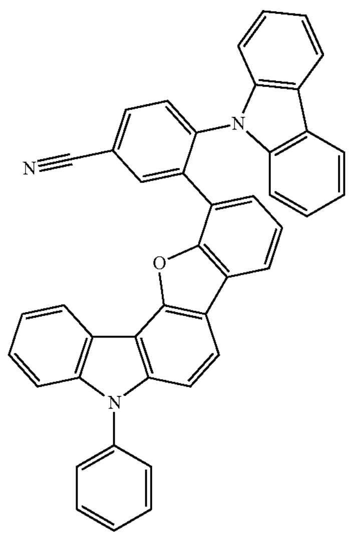
83
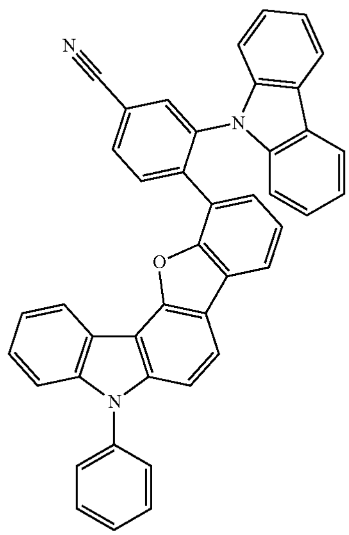
84
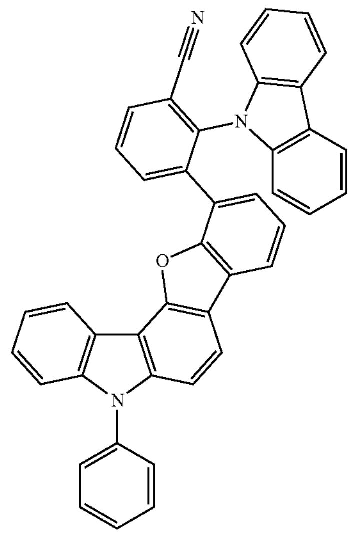
85
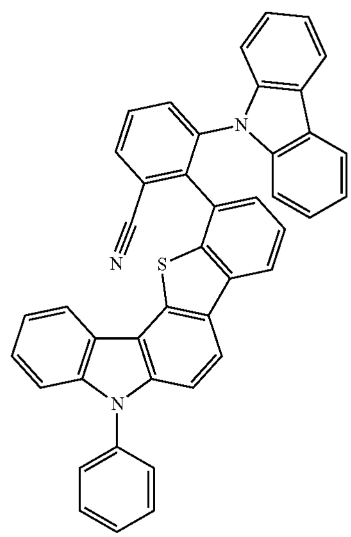
86
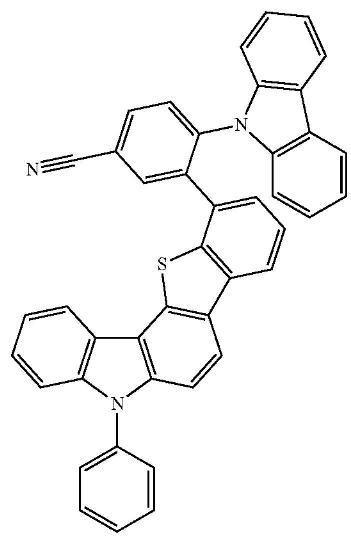

-continued
87
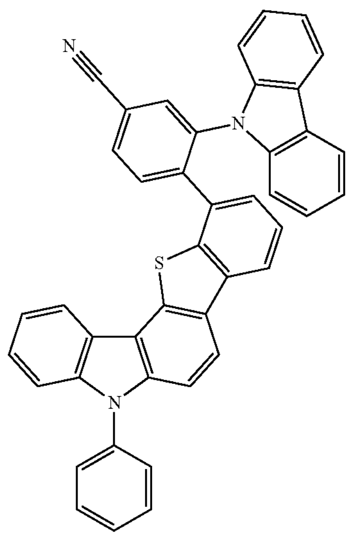
88
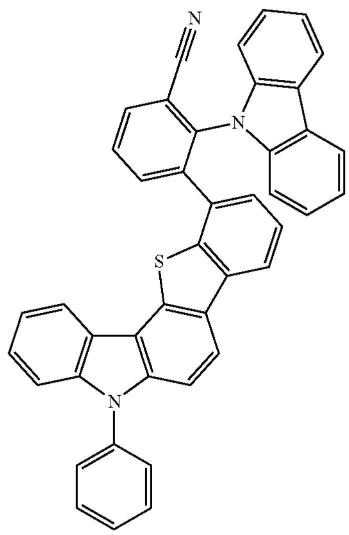
89
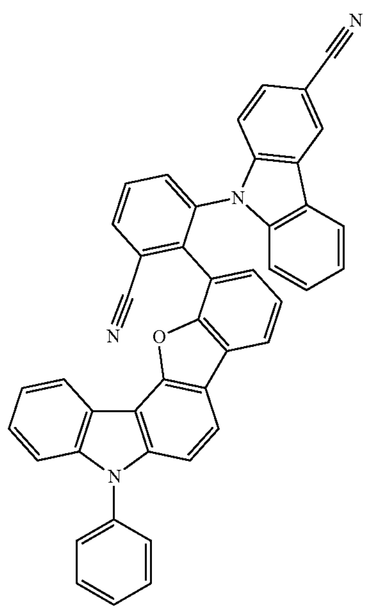
-continued
90
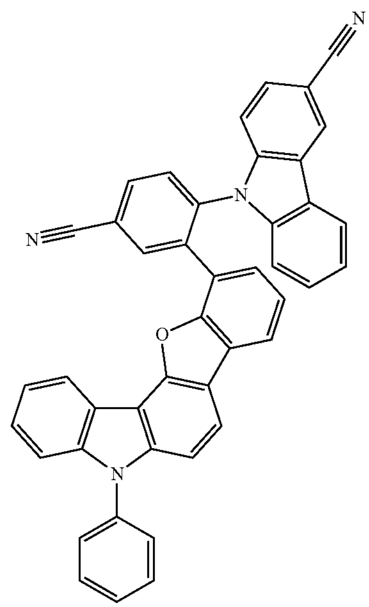
91
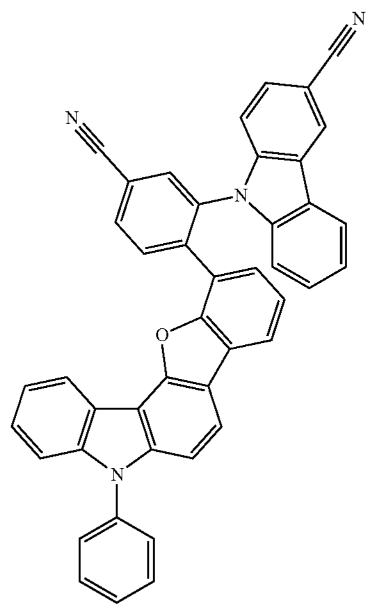

-continued
92
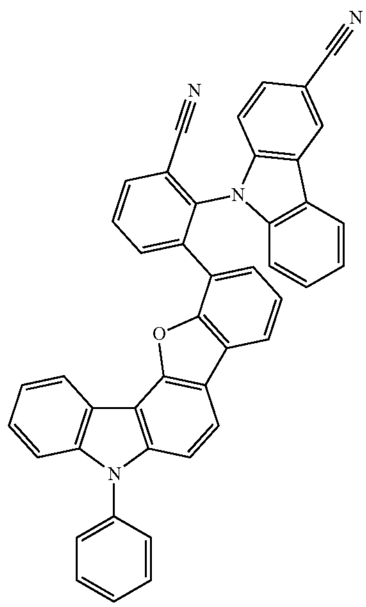
93
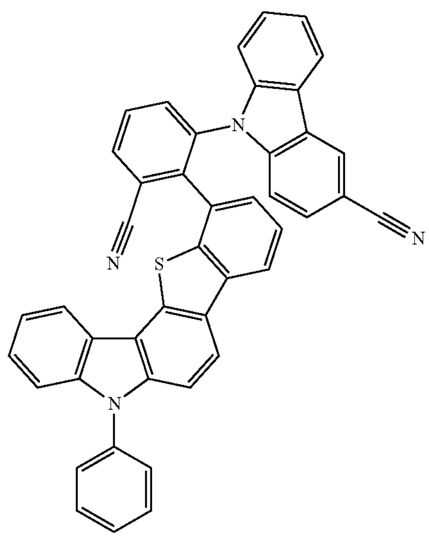
94
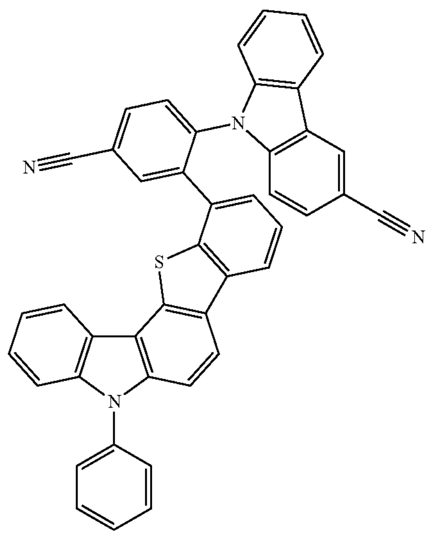
-continued
95
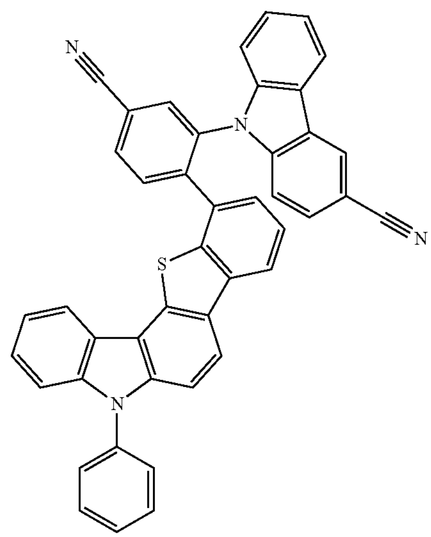
96
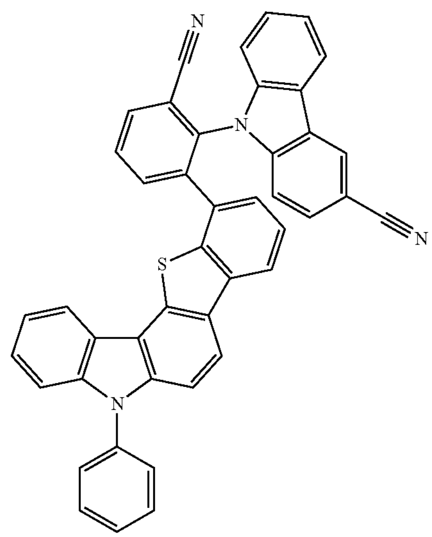
97
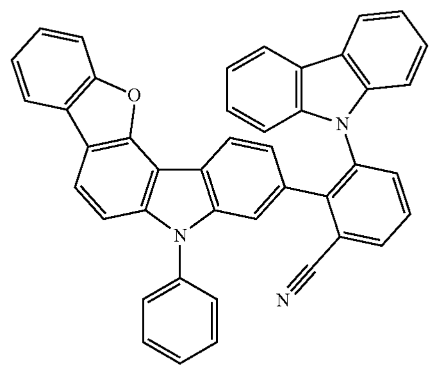

-continued
98
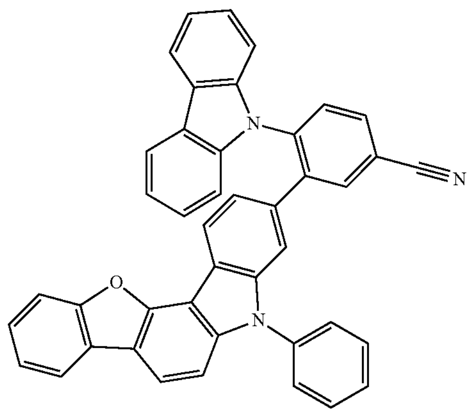
99
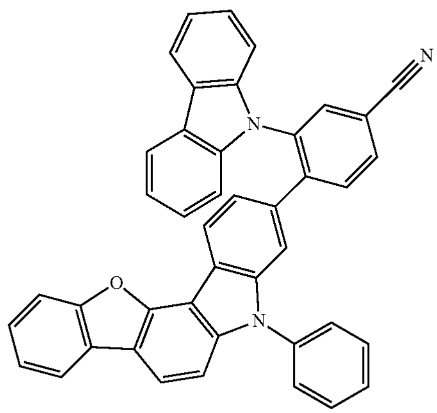
100
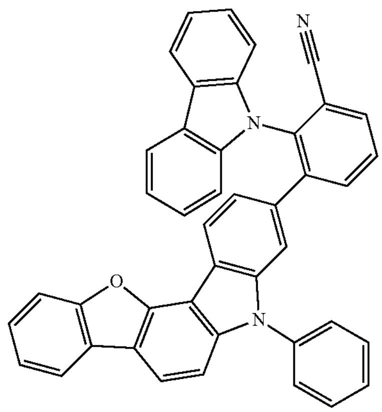
101
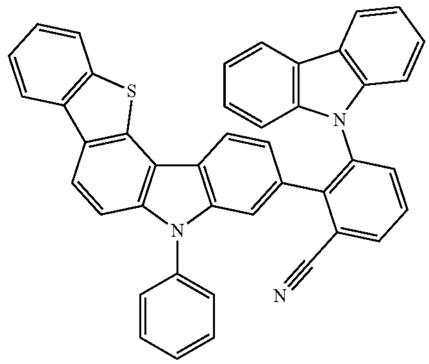
-continued
102
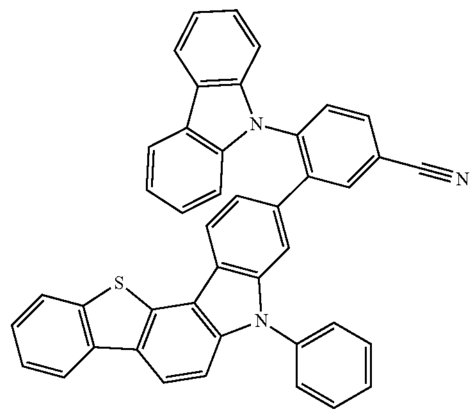
103
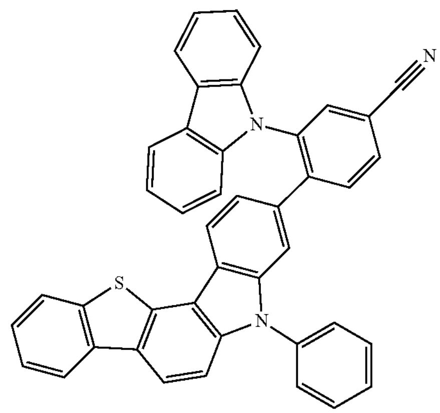
104
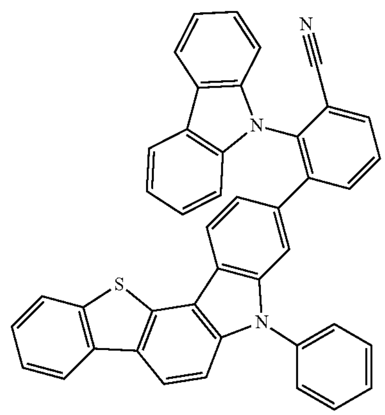
105
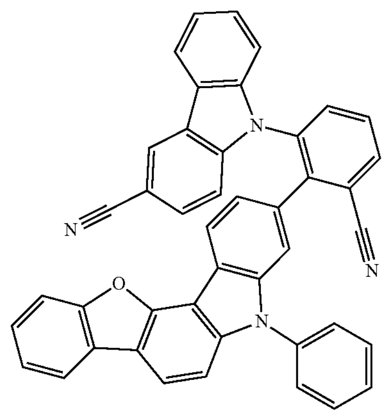

-continued
106
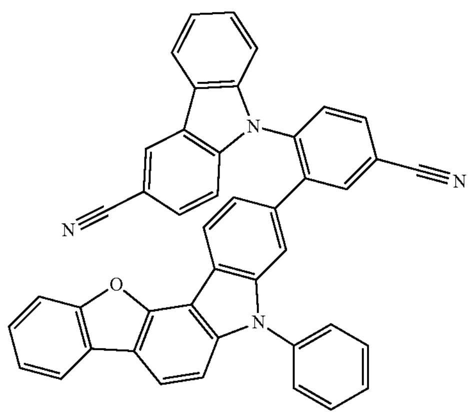
107
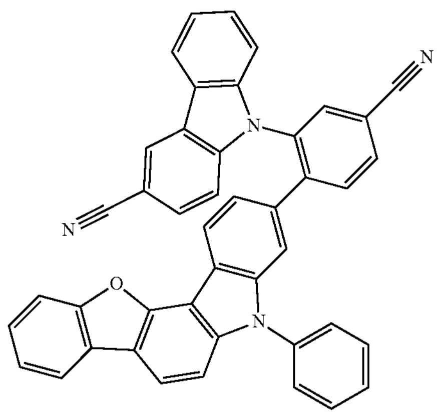
108
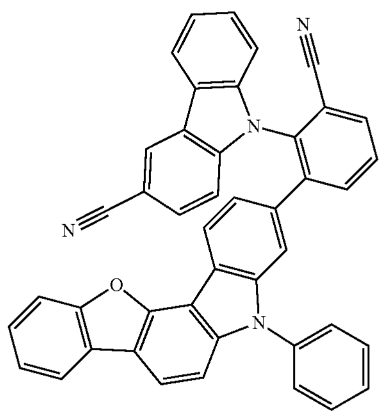
109
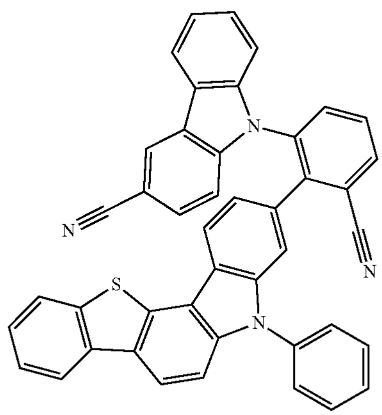
-continued
110
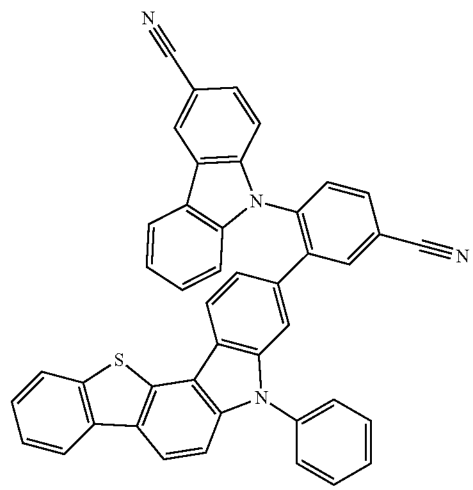
111
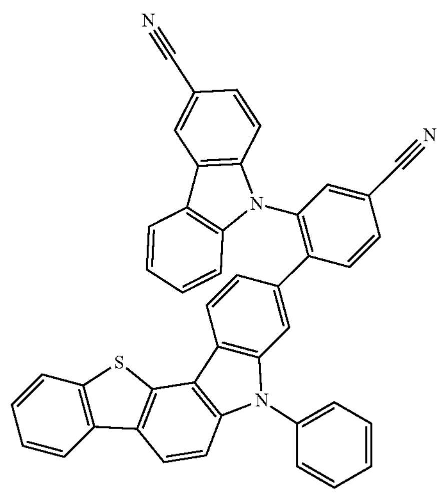
112
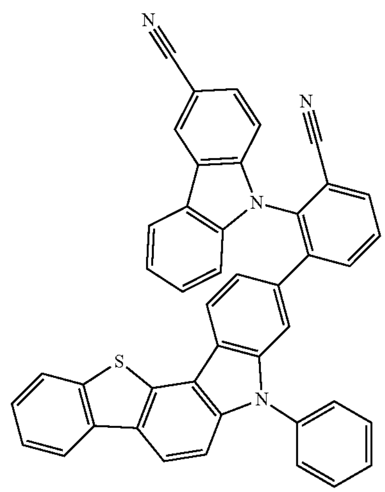

-continued
113
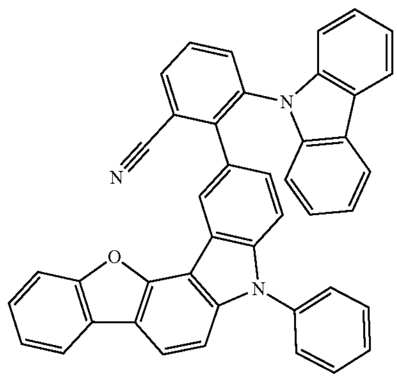
114
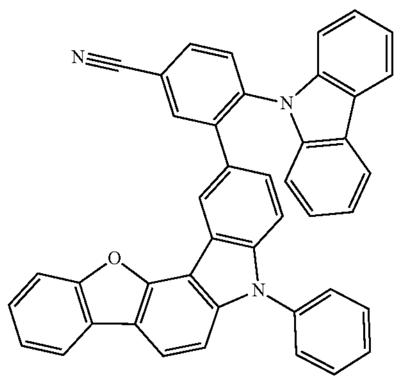
115
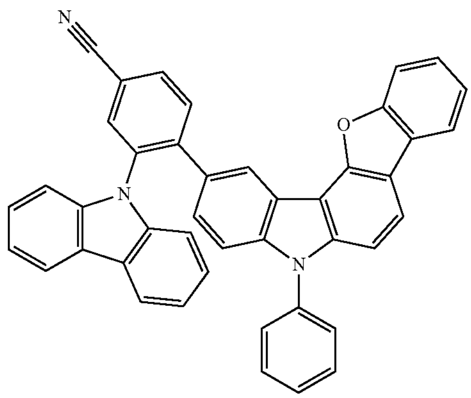
116
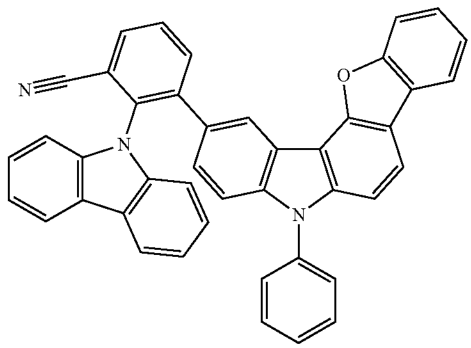
-continued
117
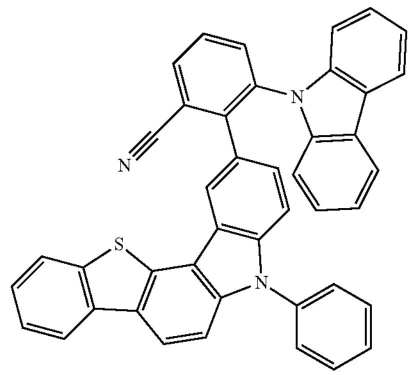
118
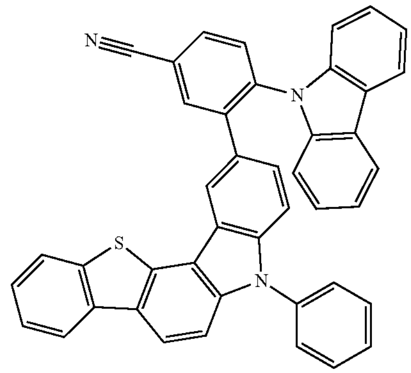
119
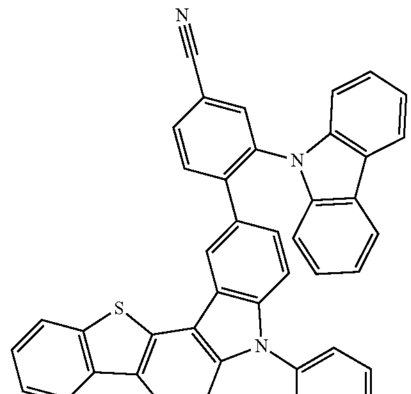
120
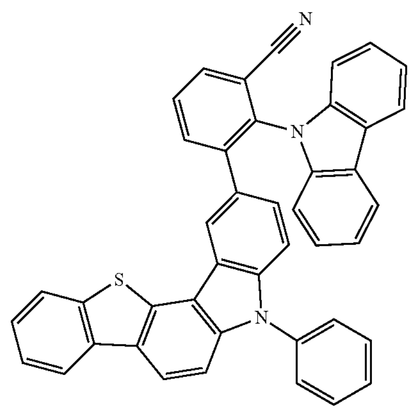

-continued
121
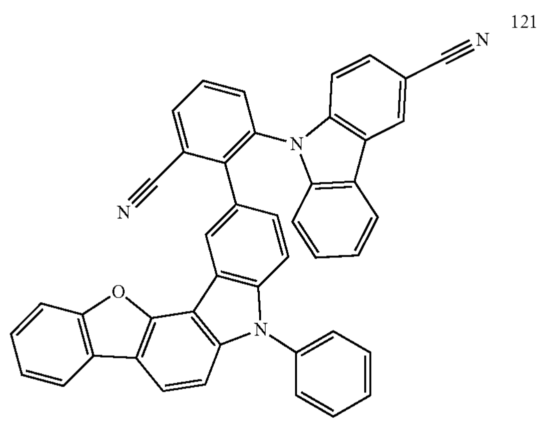
122
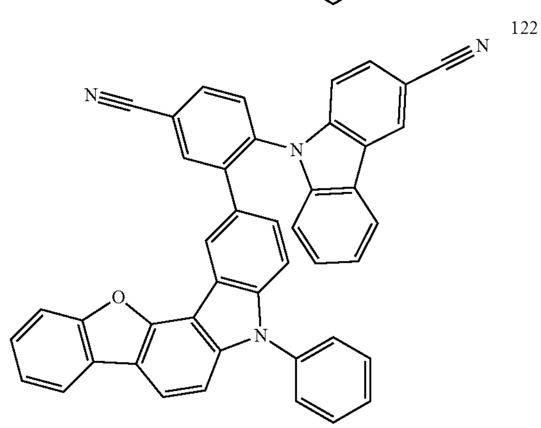
123
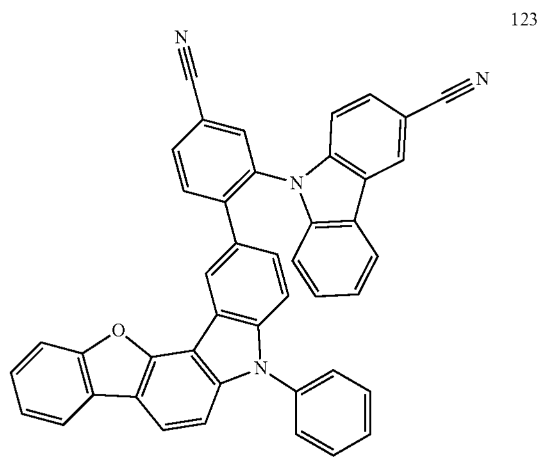
124
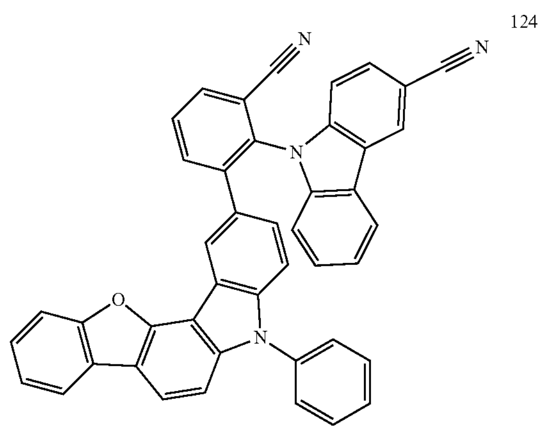
-continued
125
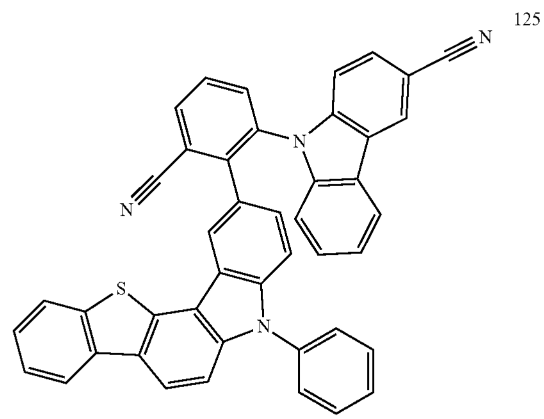
126
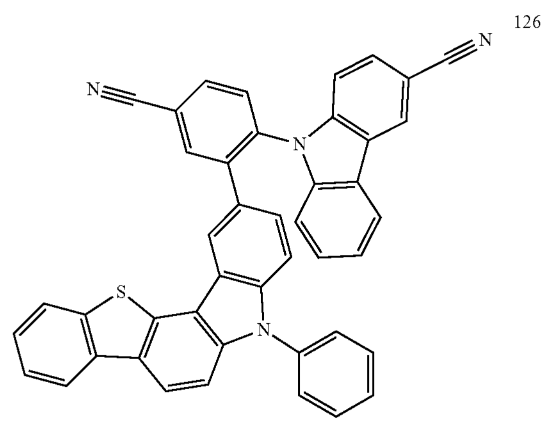
127
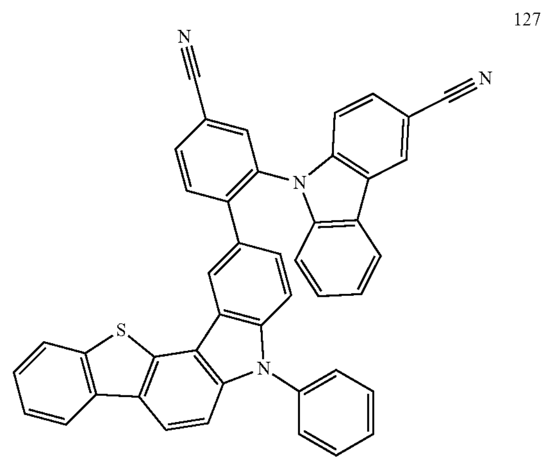
128
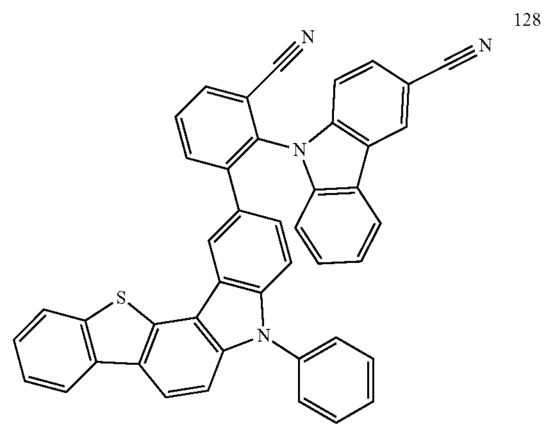

129
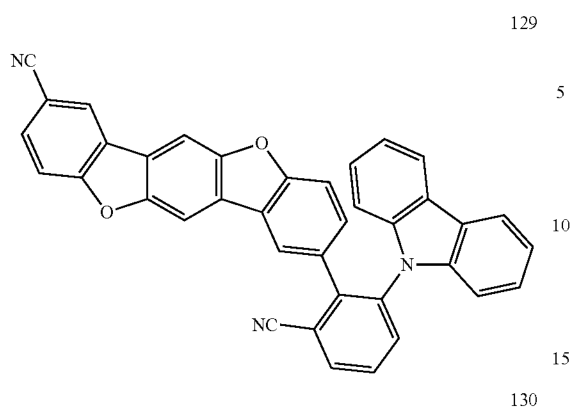
130
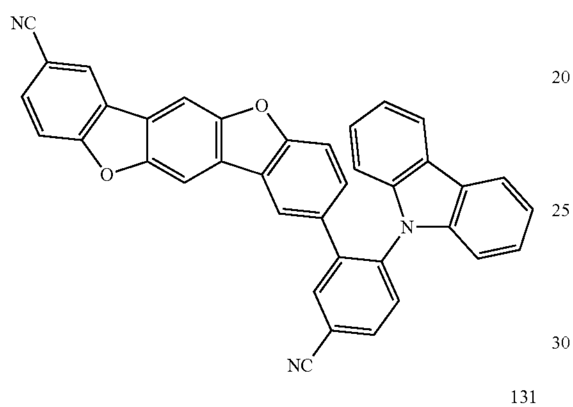
131
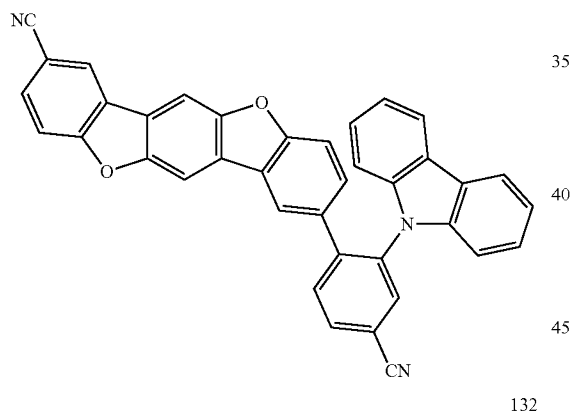
132
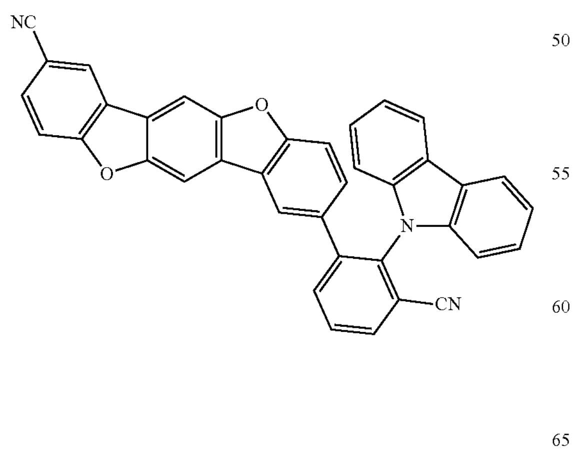
133
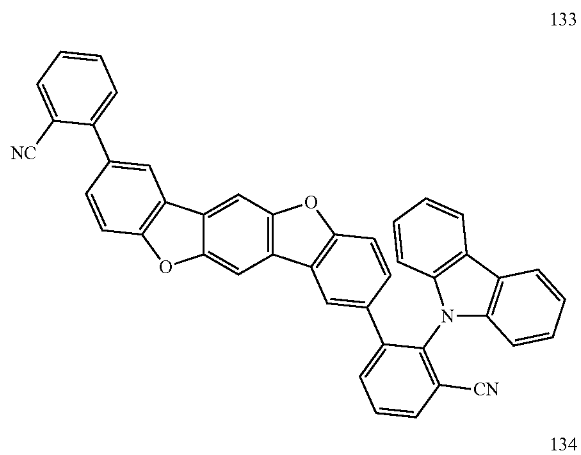
134
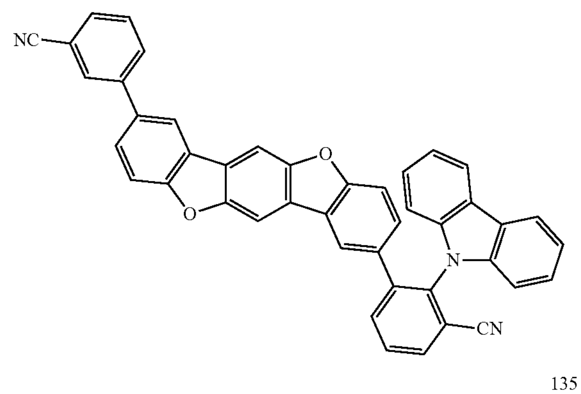
135
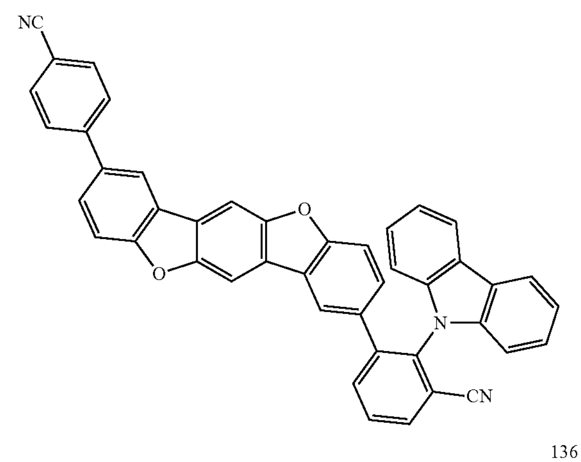
136
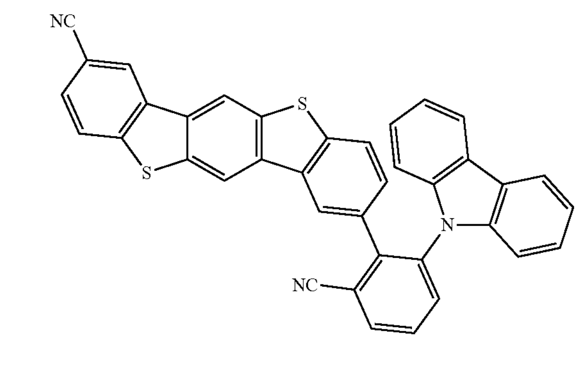

-continued
137
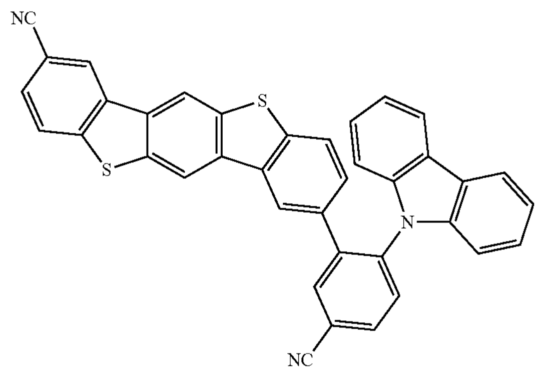
138
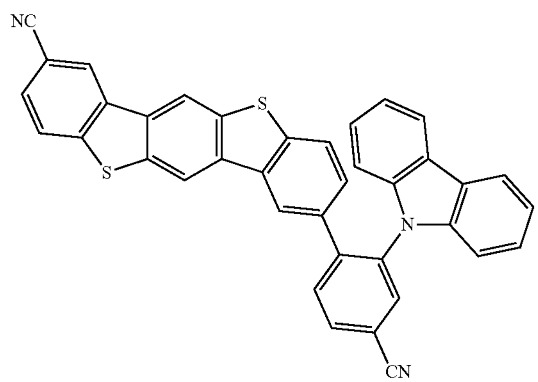
139
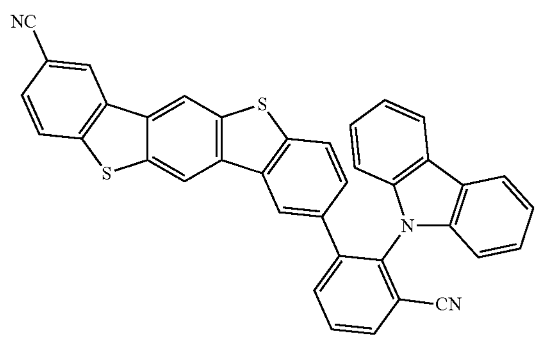
140
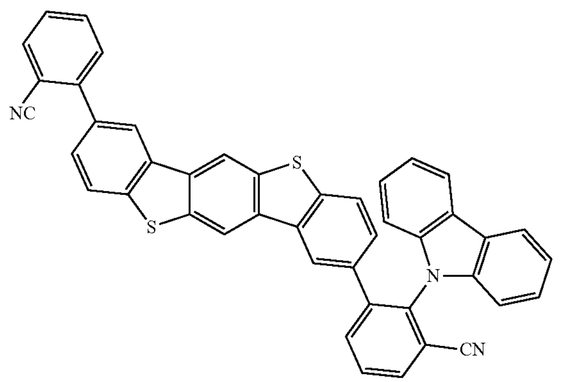
-continued
141
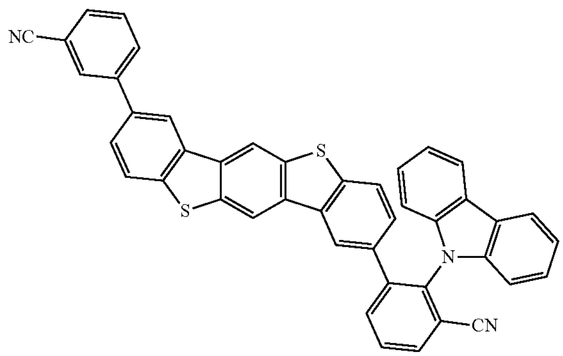
142
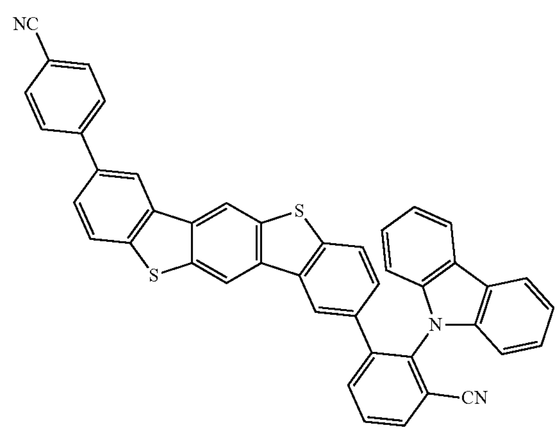
143
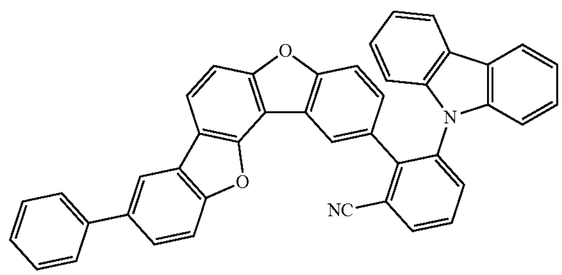
144
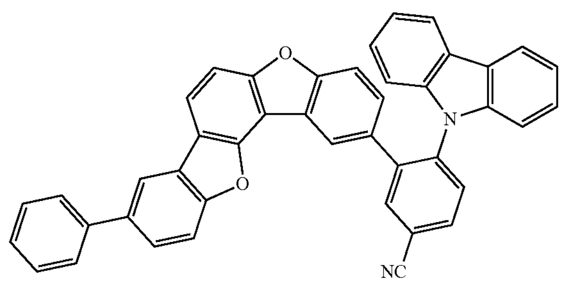

-continued
145
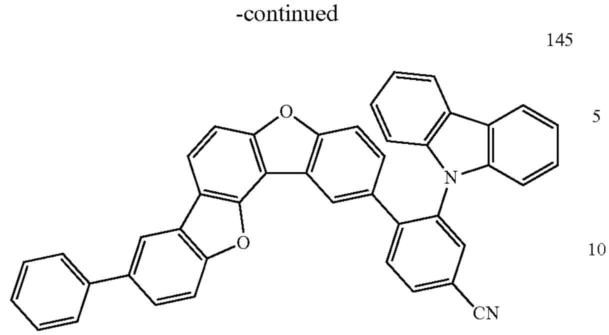
146
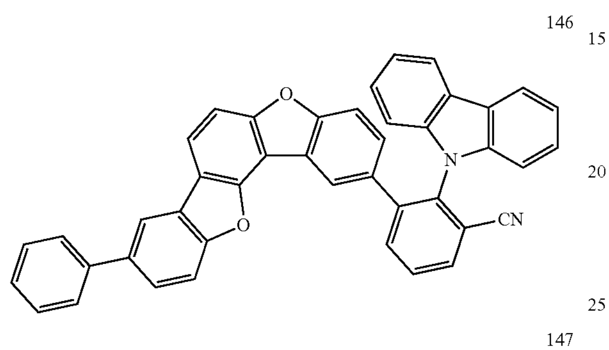
147
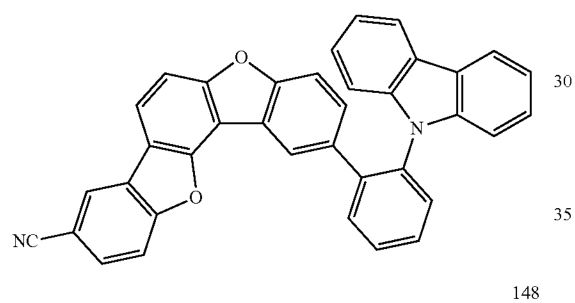
148
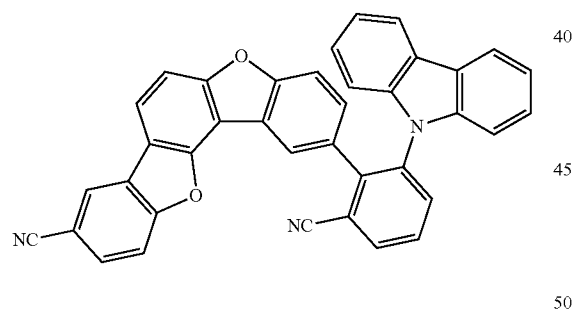
149
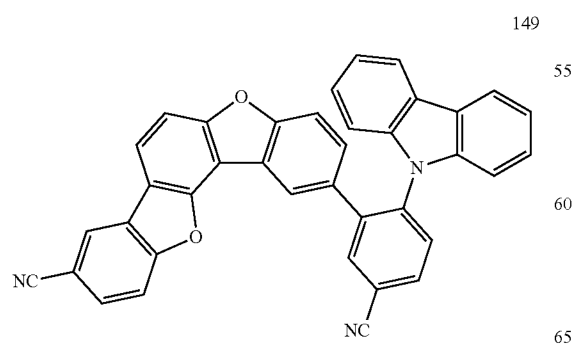
-continued
150
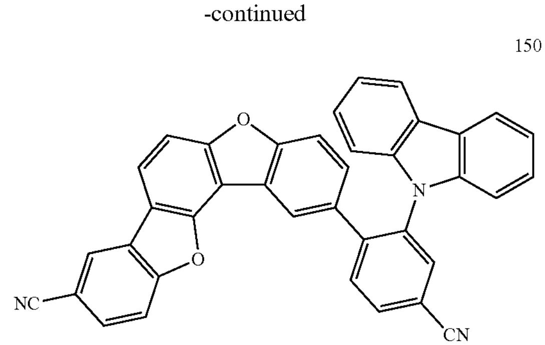
151
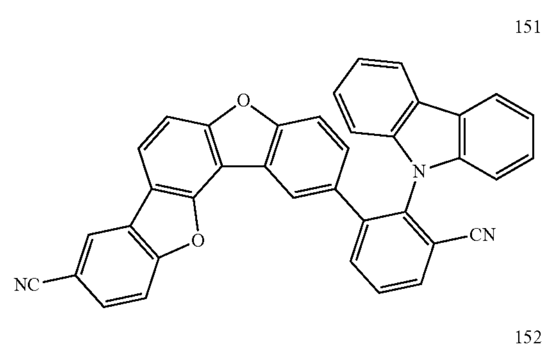
152
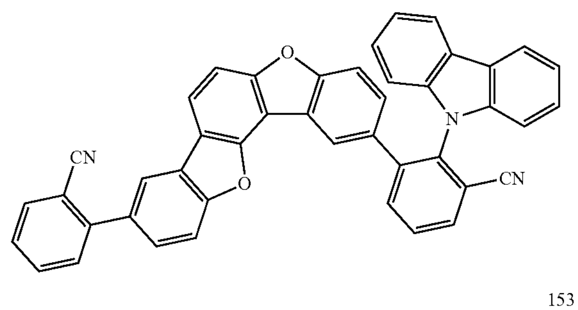
153
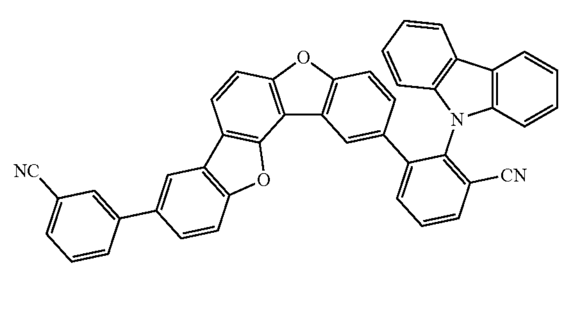
154
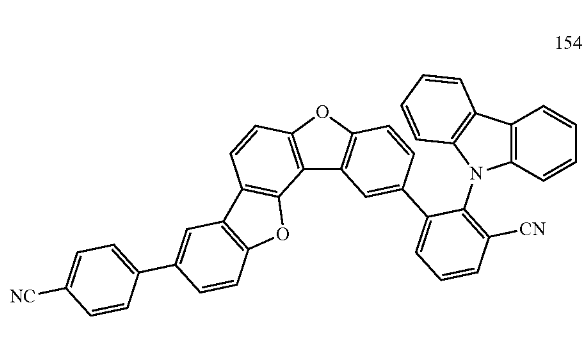

-continued
155
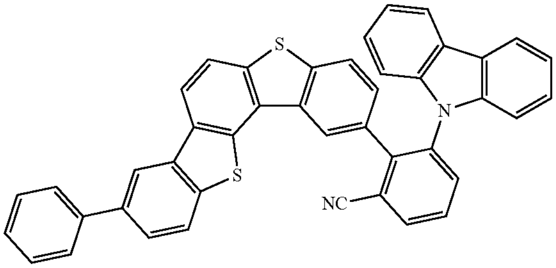
156
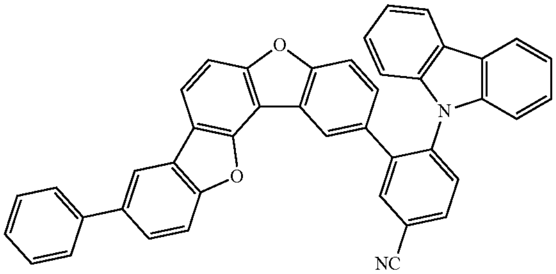
157
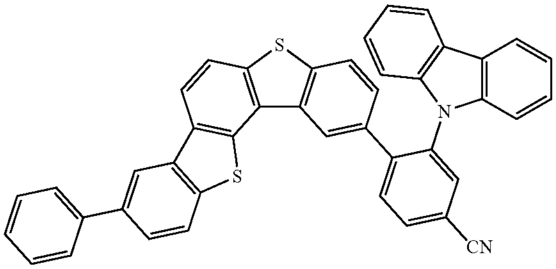
158
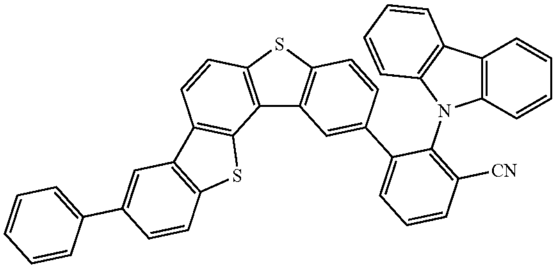
159
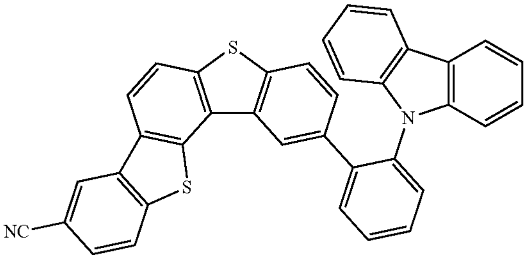
-continued
160
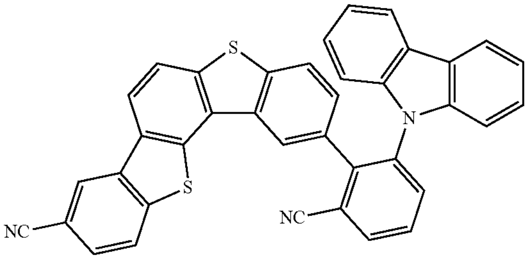
161
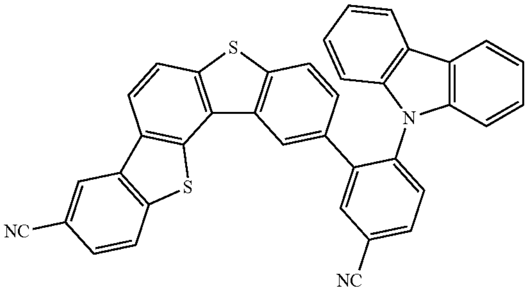
162
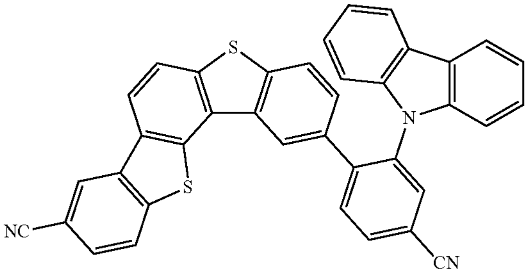
163
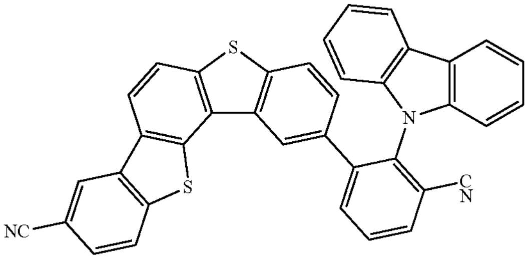
164
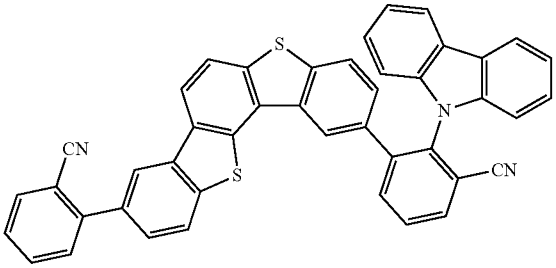

-continued
165
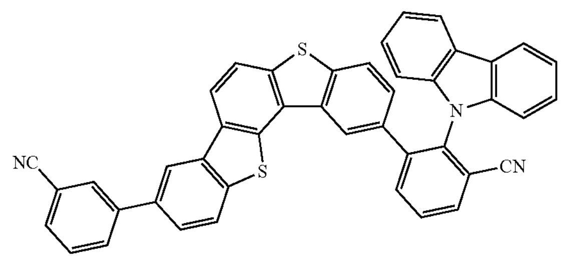
166
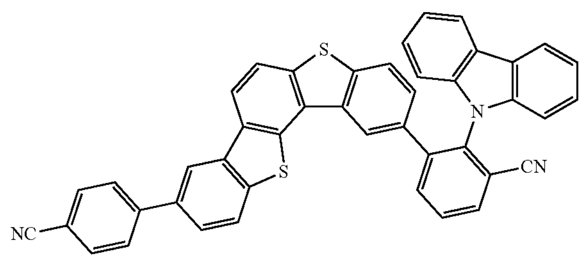
167
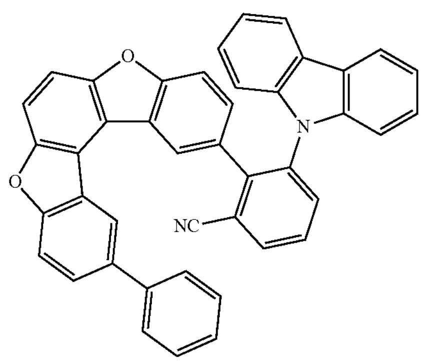
168
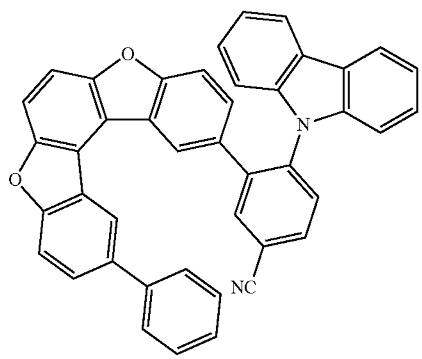
169
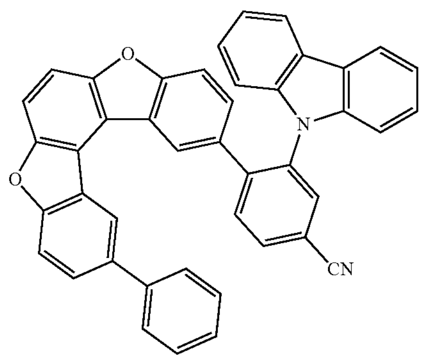
-continued
170
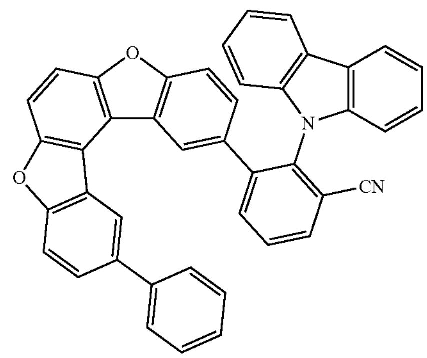
171
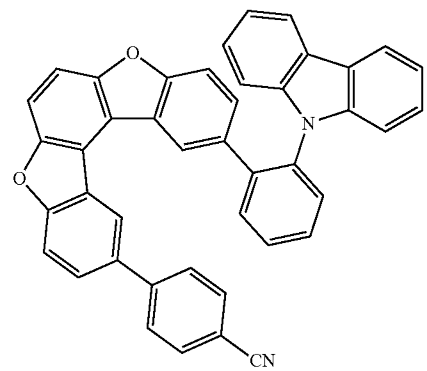
172
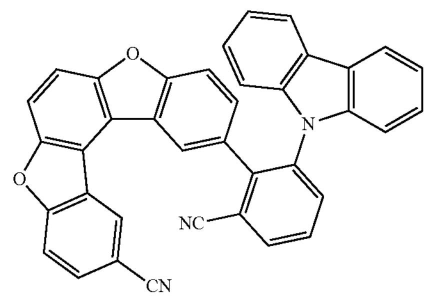
173
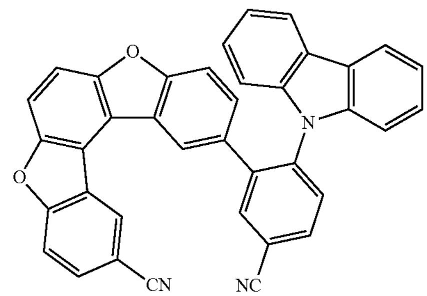
174
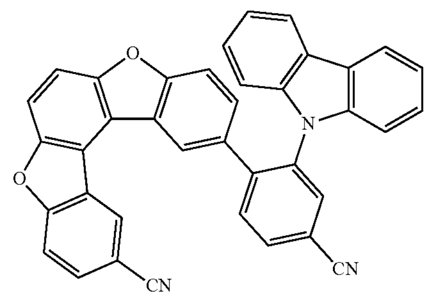

-continued
175
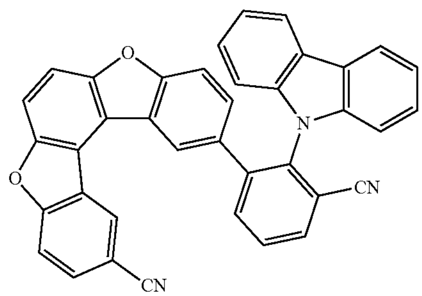
176
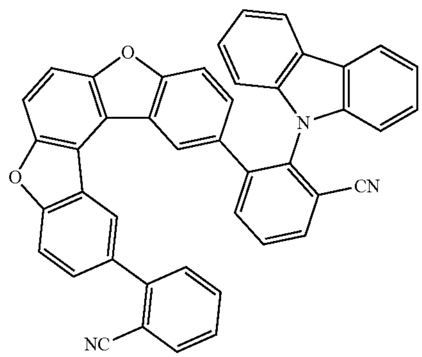
177
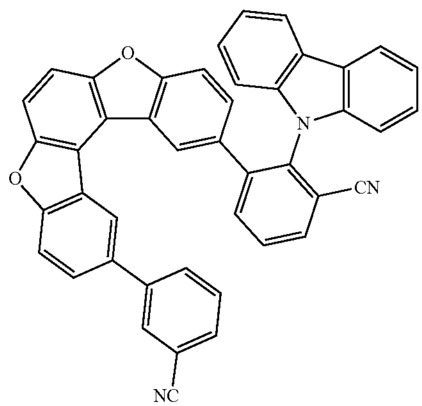
178
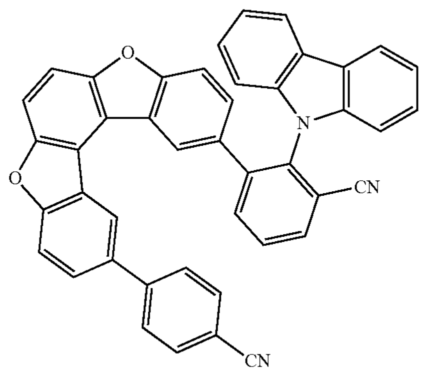
-continued
179
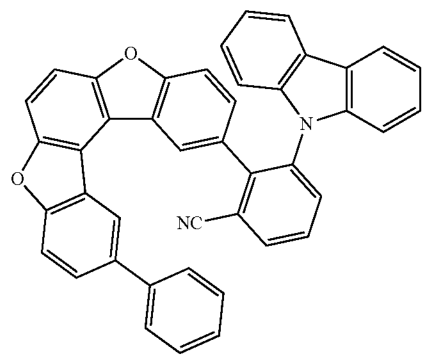
180
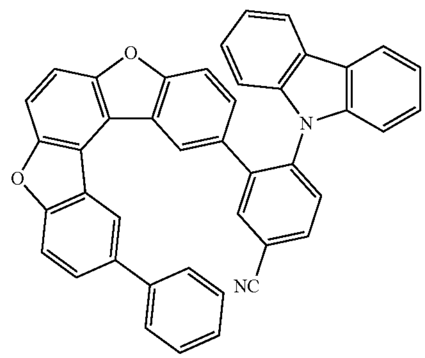
181
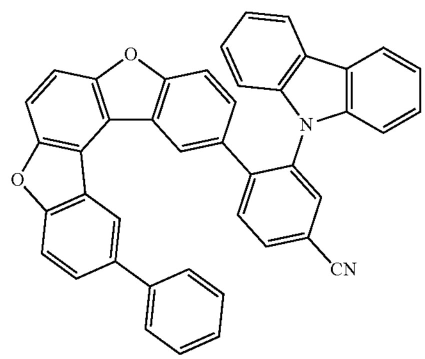
182
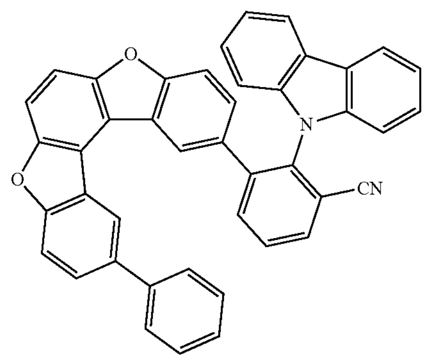

-continued
183
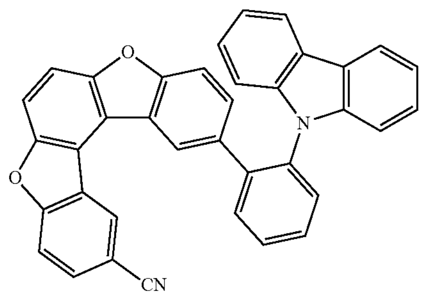
184
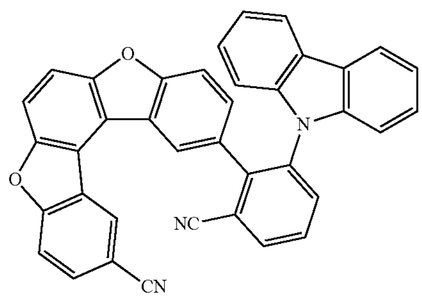
185
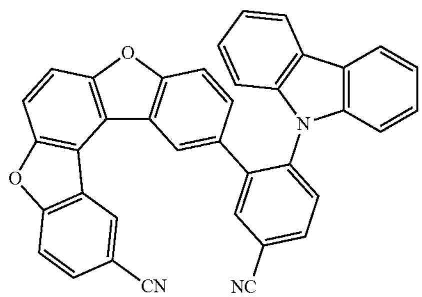
186
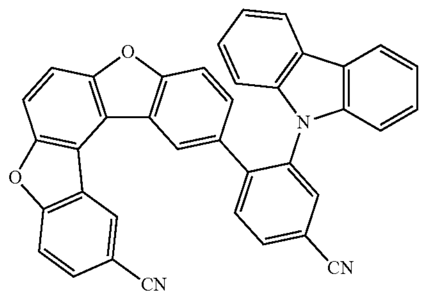
187
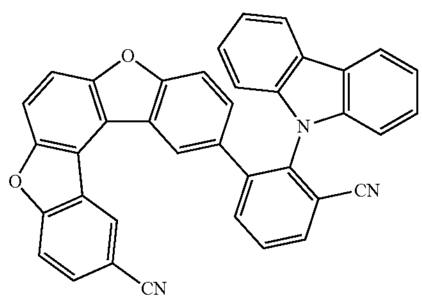
-continued
188
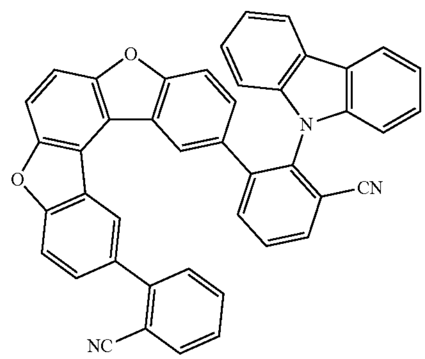
189
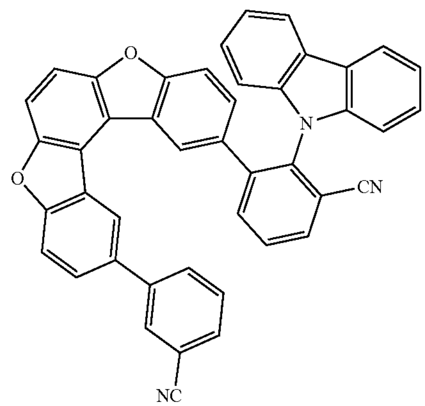
190
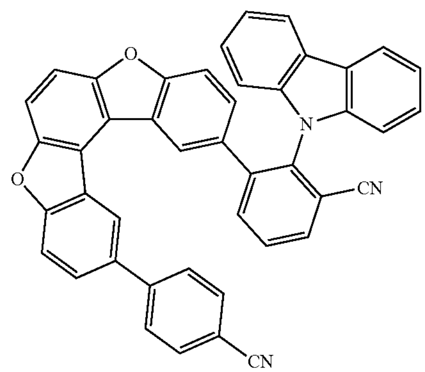
191
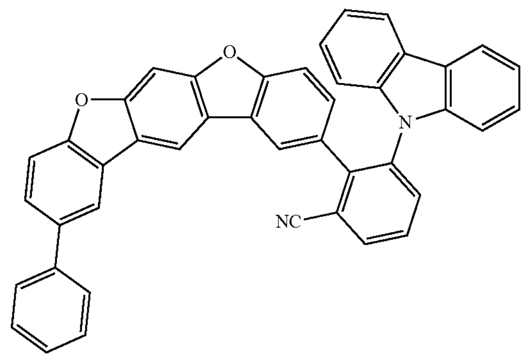

-continued
192
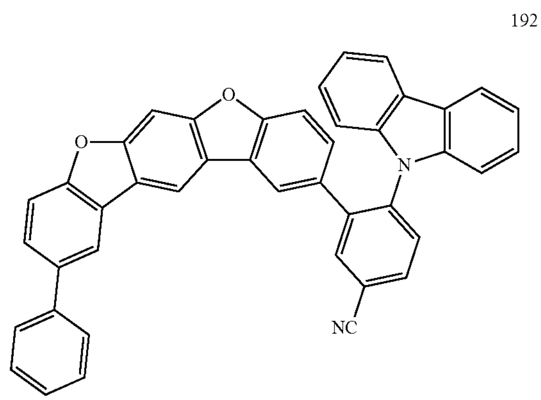
193
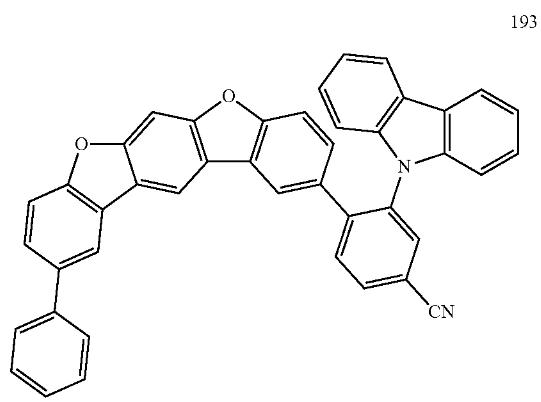
194
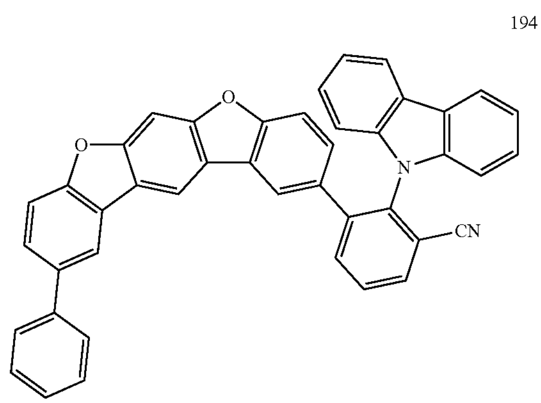
195
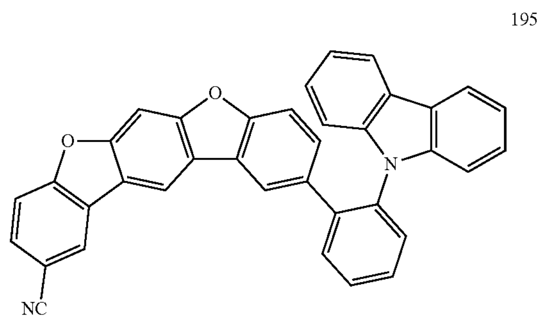
-continued
196
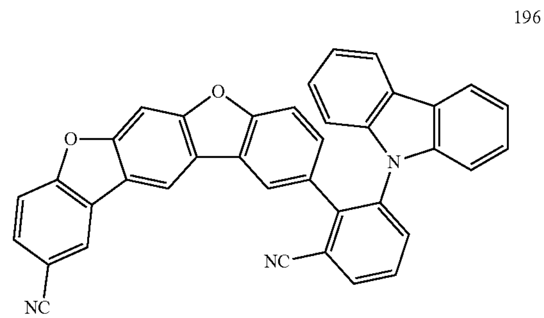
197
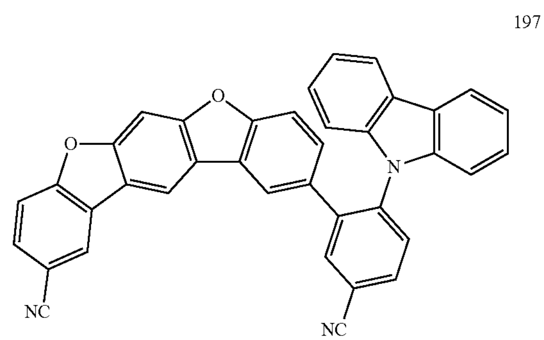
198
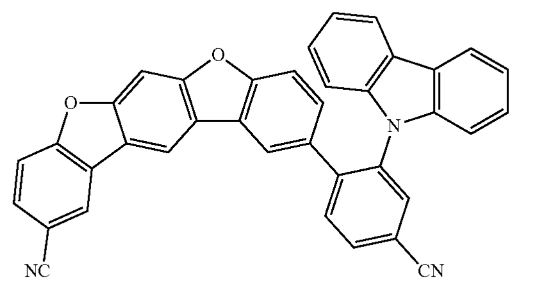
199
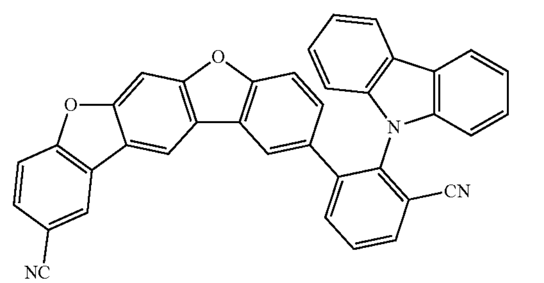
200
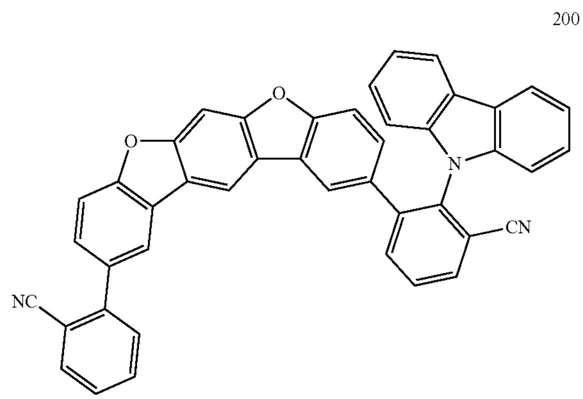

-continued
201
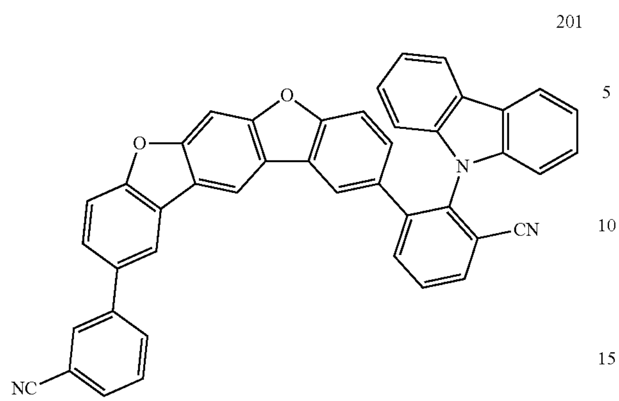
202
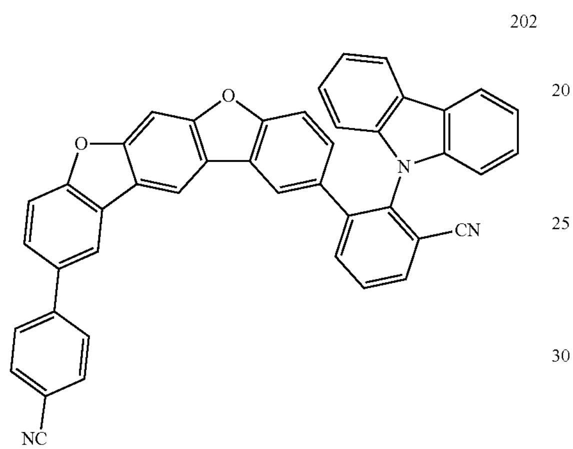
203
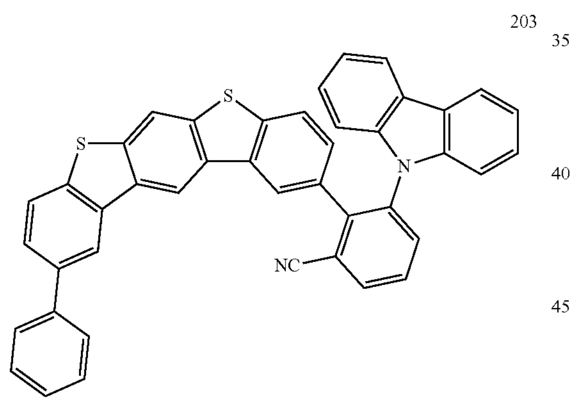
204
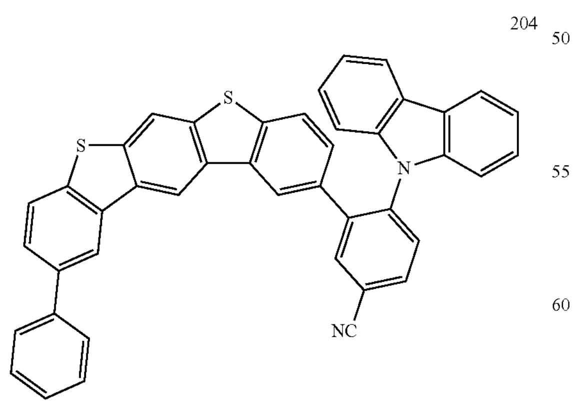
-continued
205
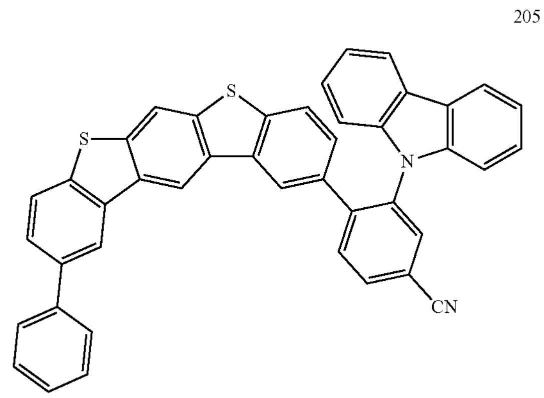
206
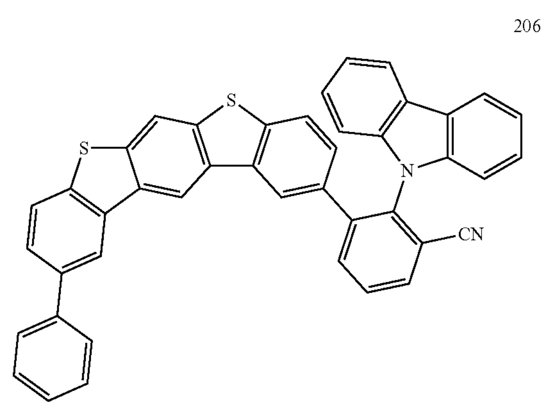
207
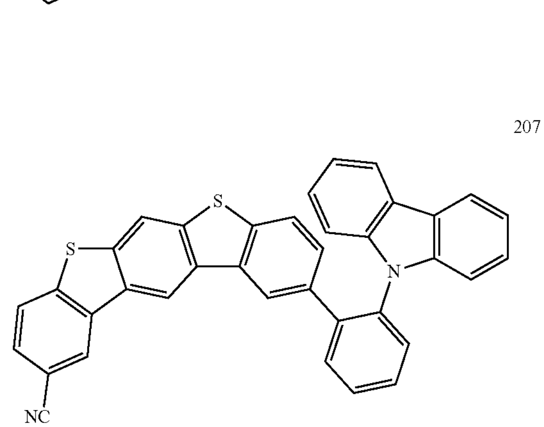
208
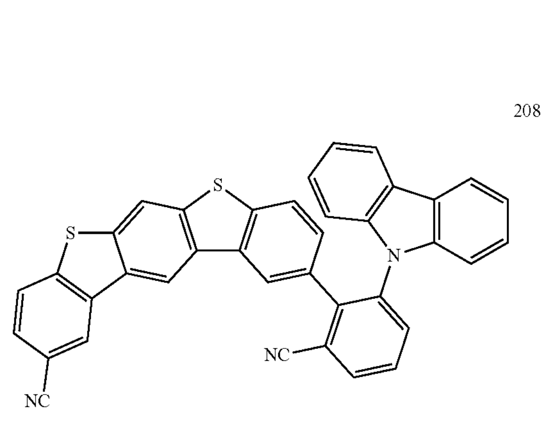

-continued
209
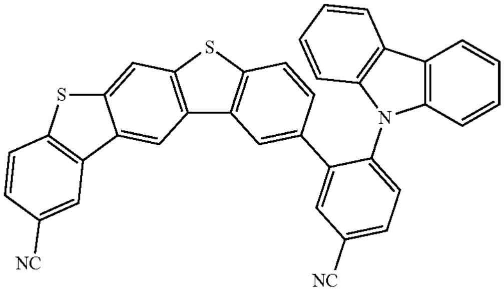
210
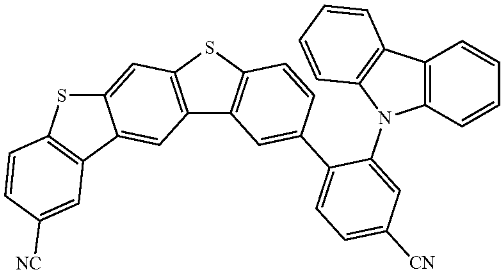
211
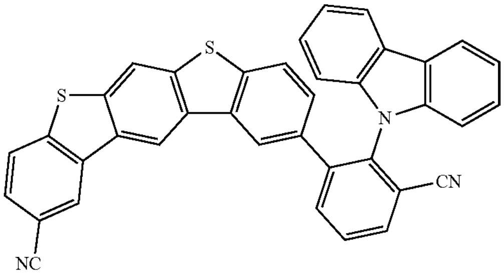
212
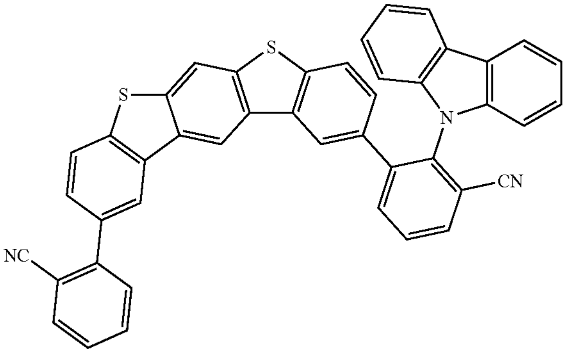
-continued
213
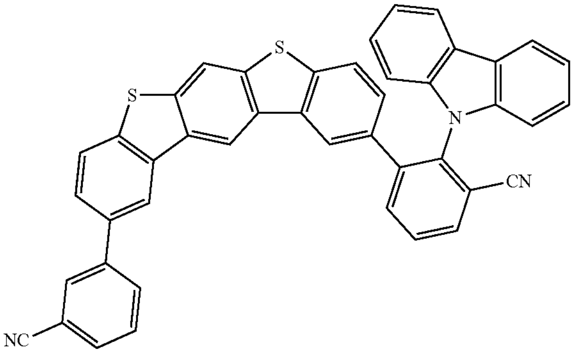
214
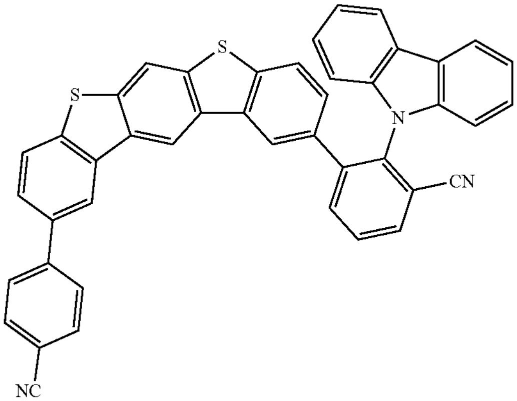
215
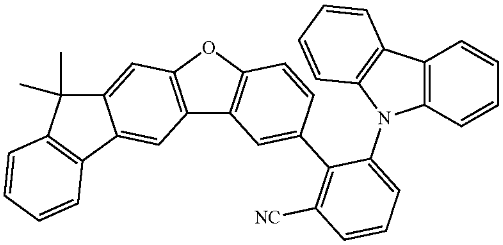
216
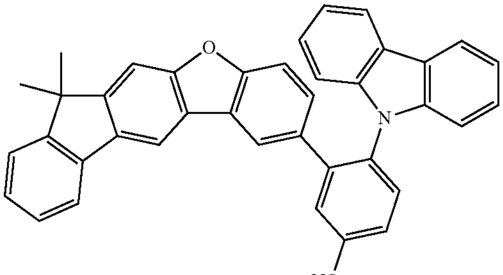

-continued
217
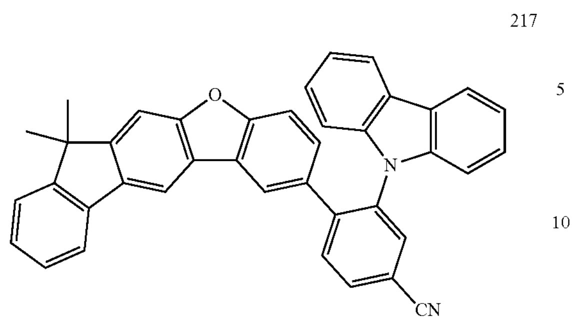
218
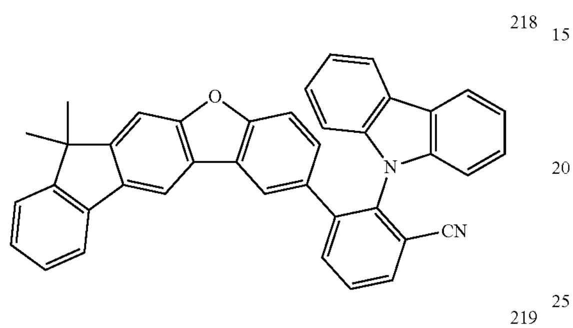
219
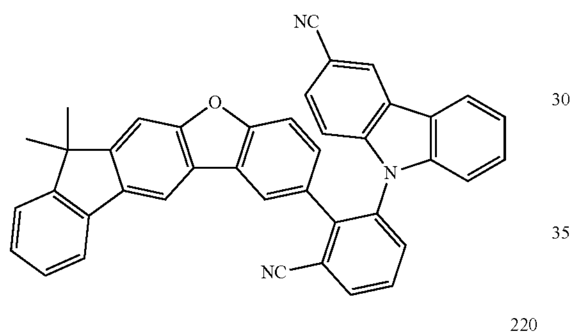
220
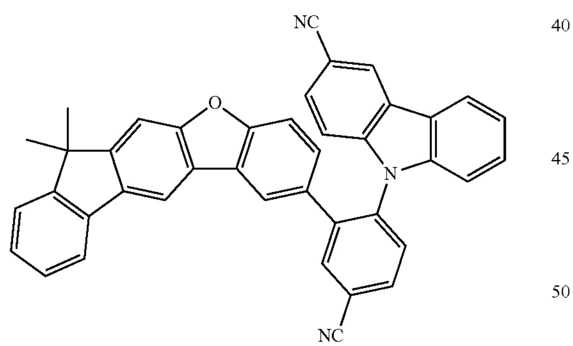
221
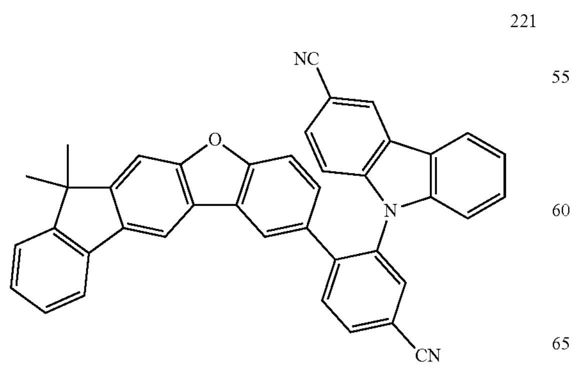
-continued
222
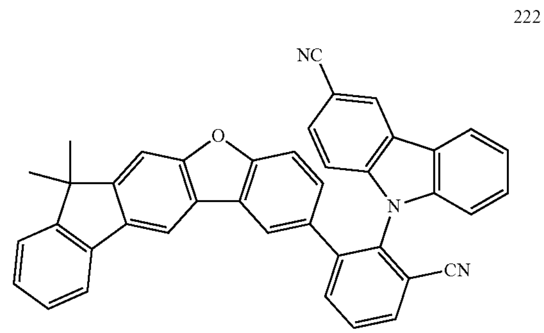
223
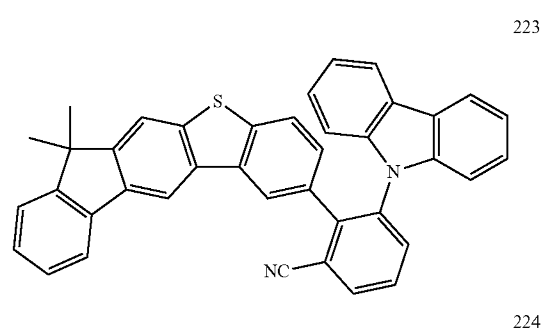
224
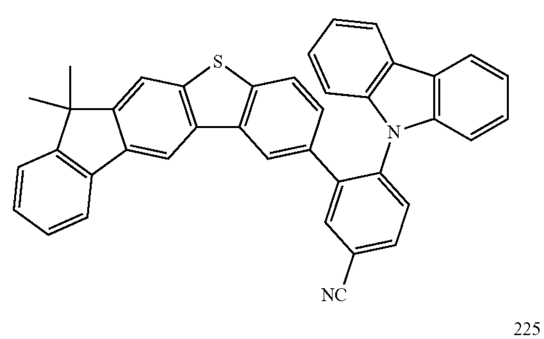
225
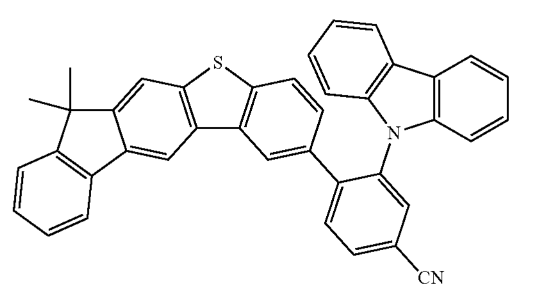
226
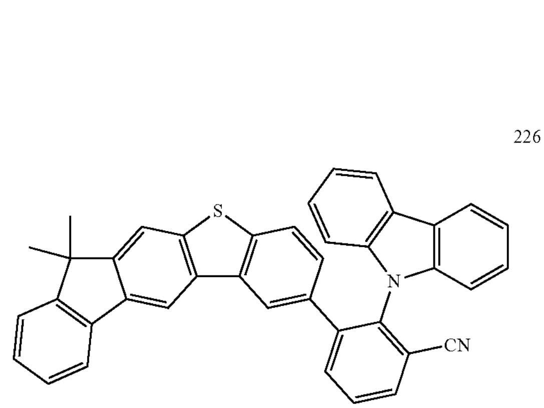

-continued
227
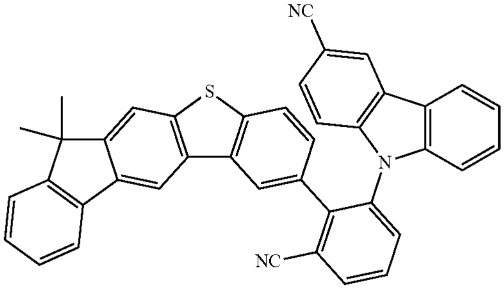
228
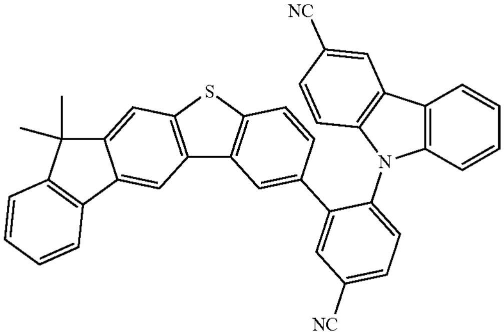
229
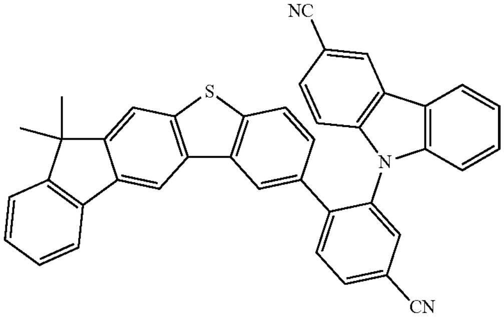
230
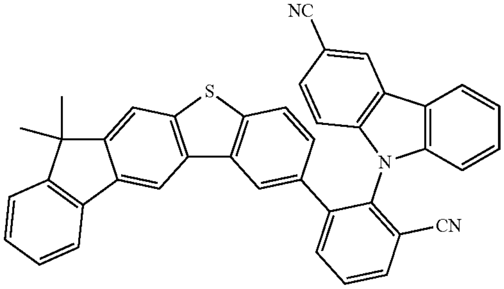
231
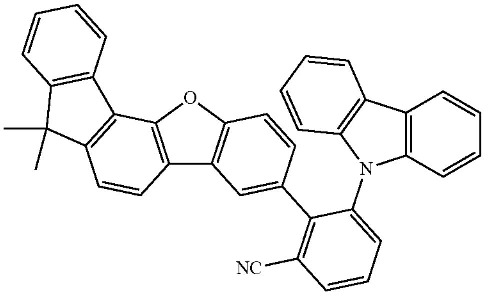
-continued
232
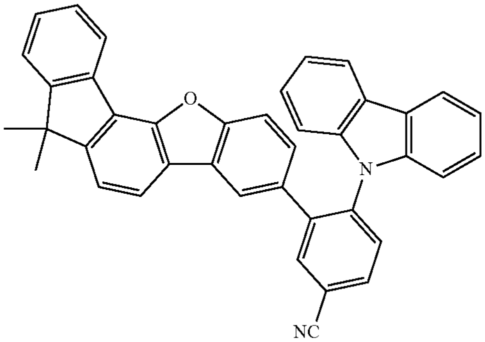
233
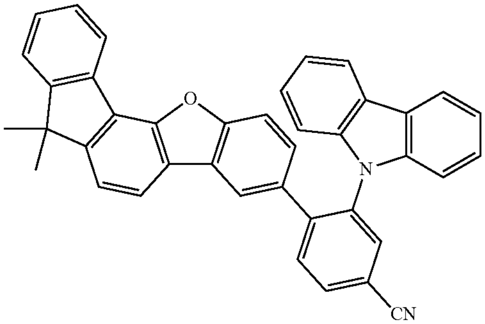
234
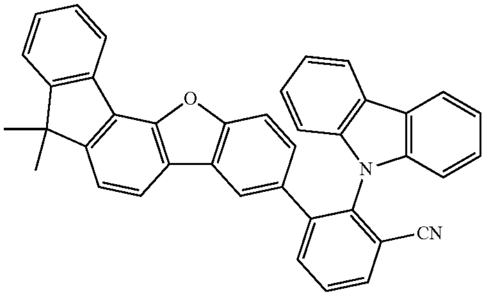
235
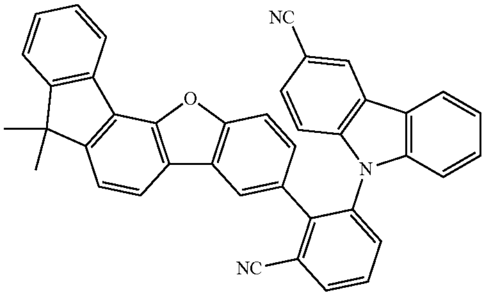
236
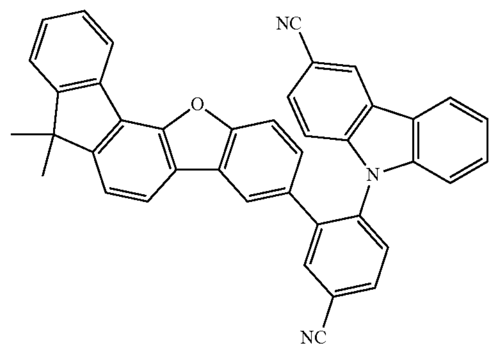

-continued
237
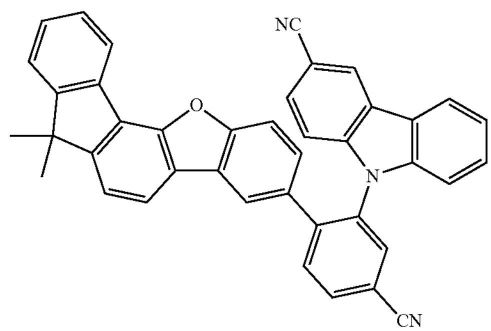
238
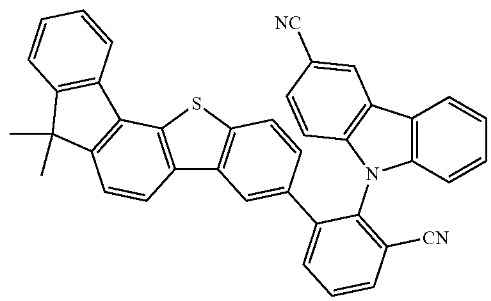
239
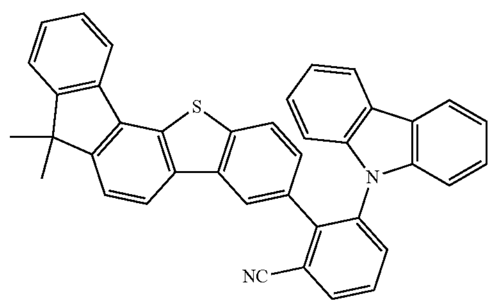
240
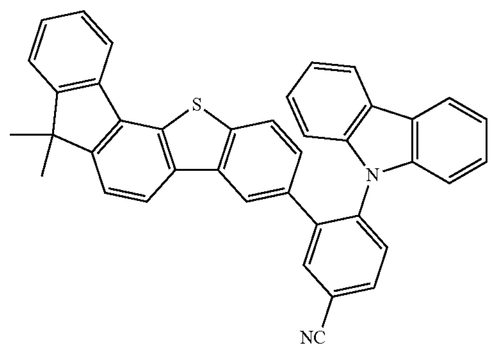
241
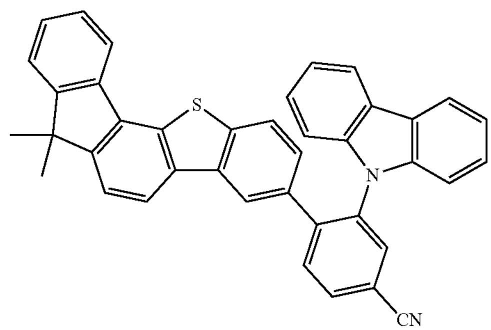
-continued
242
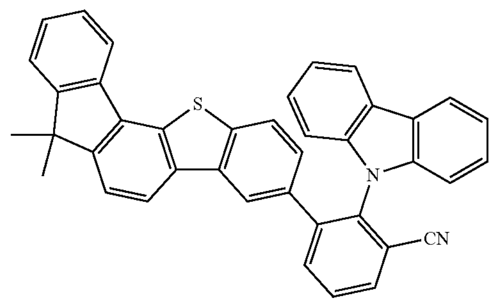
243
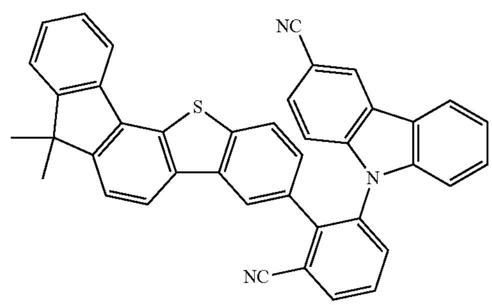
244
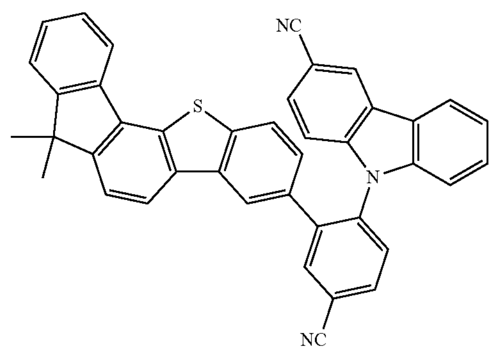
245
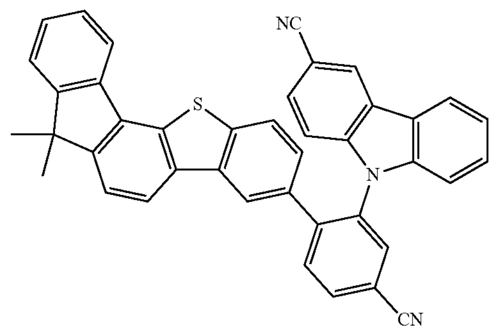
246
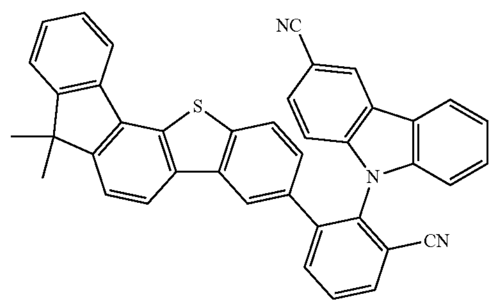

-continued
247
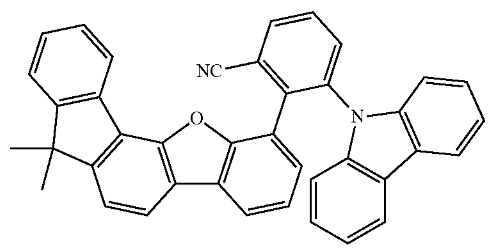
248
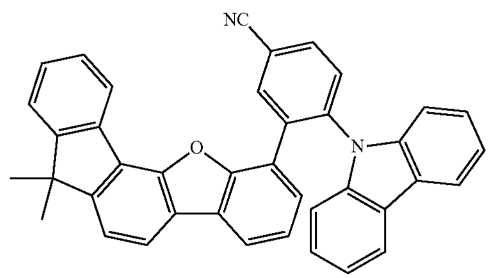
249
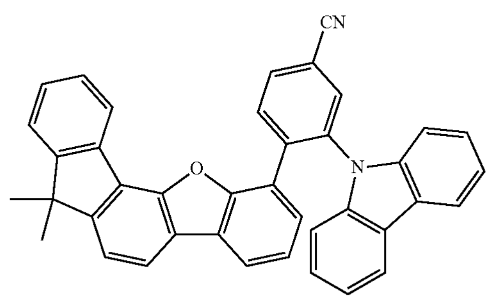
250
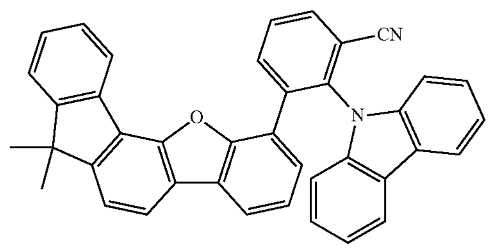
251
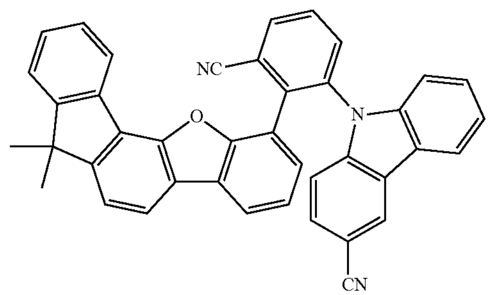
-continued
252
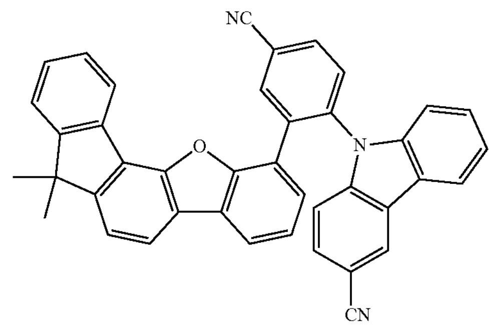
253
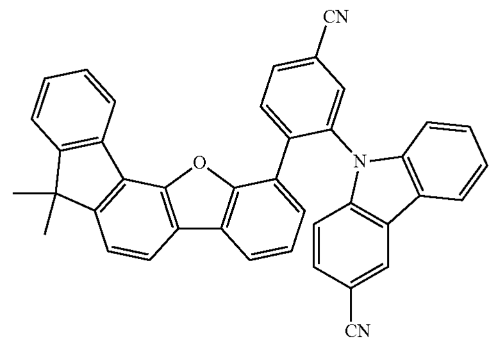
254
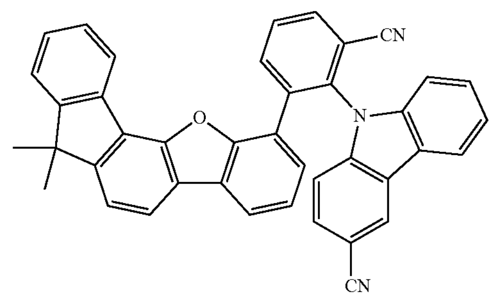
255
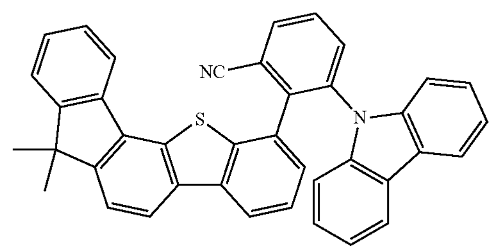
256
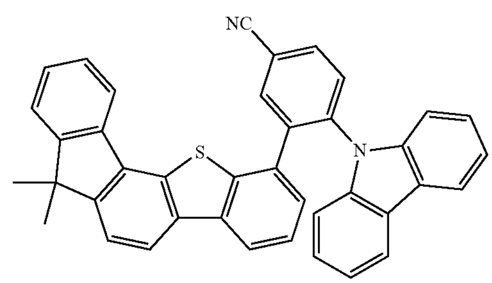

257
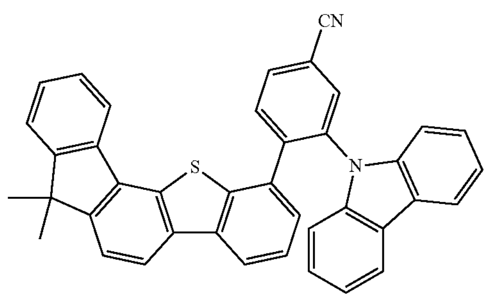
258
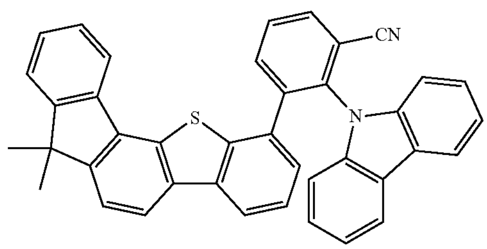
259
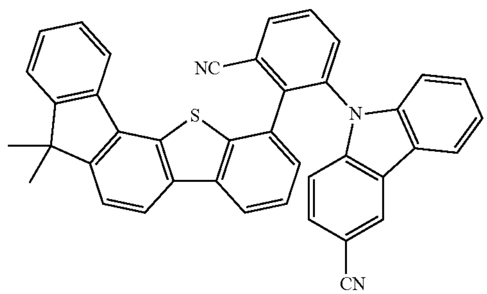
260
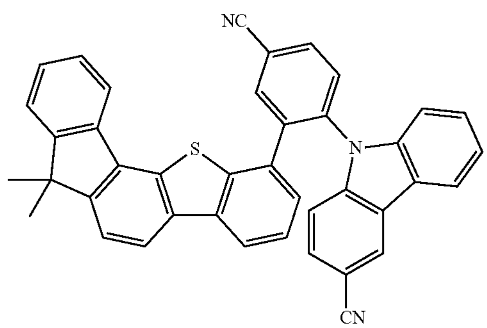
261
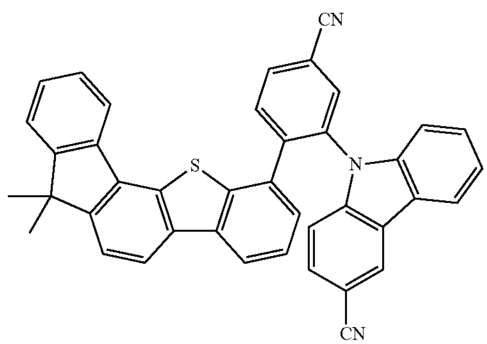
262
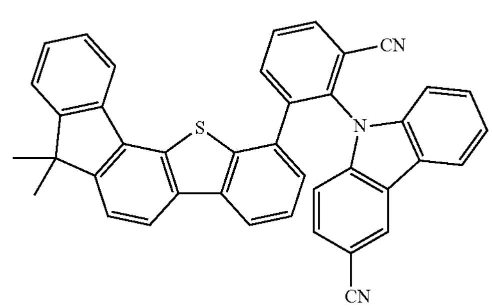
263
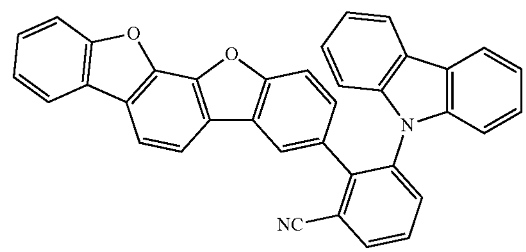
264
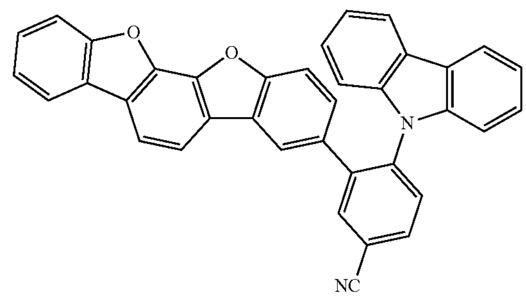
265
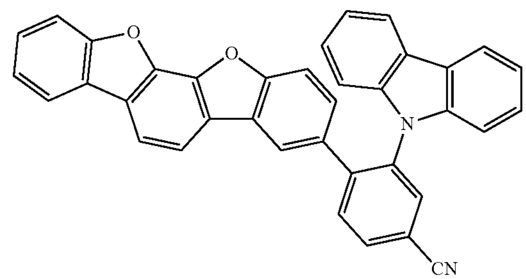
266
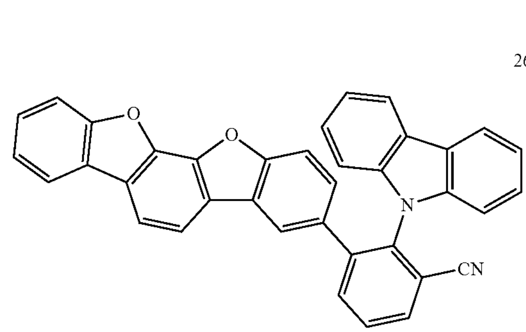

-continued
267
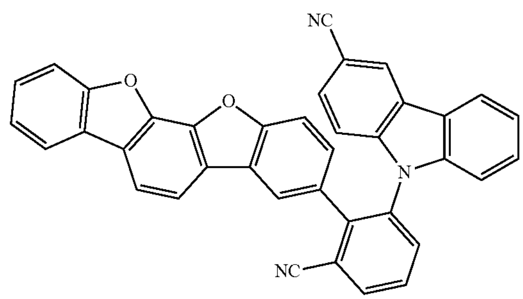
268
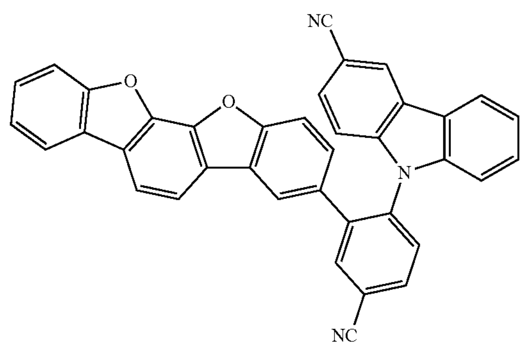
269
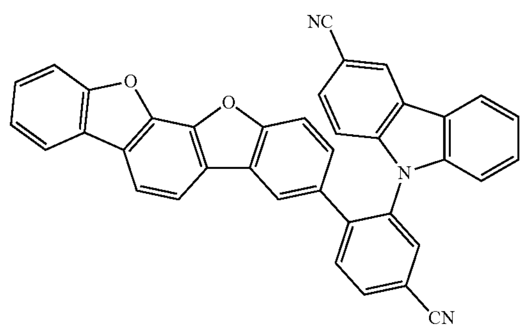
270
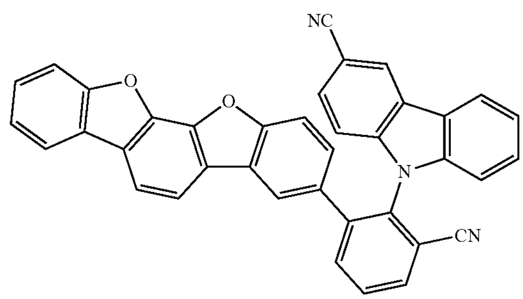
271
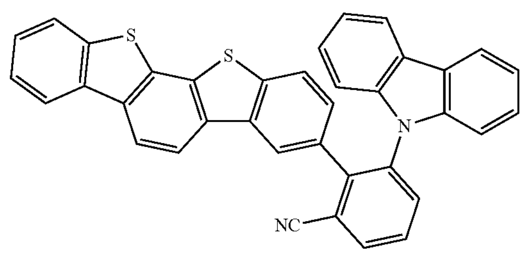
-continued
272
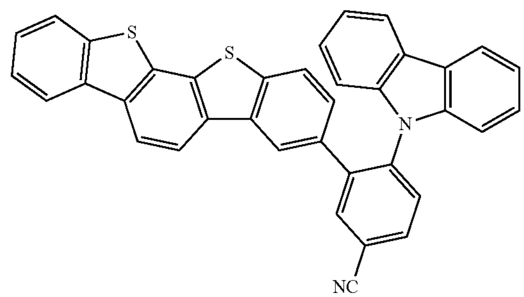
273
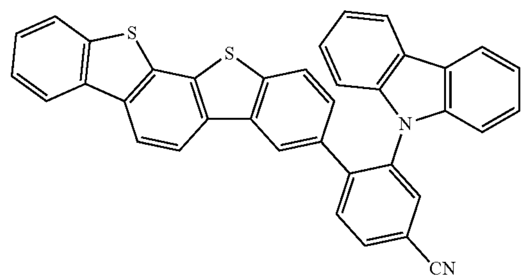
274
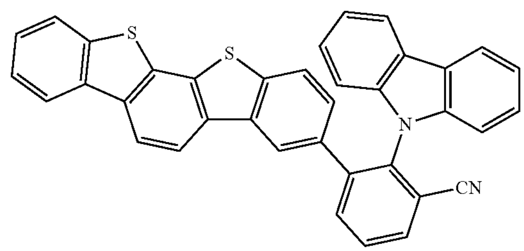
275
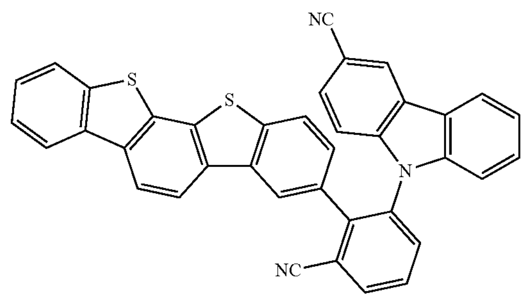
276
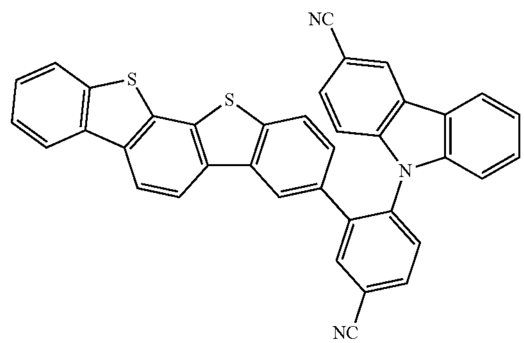

-continued
277
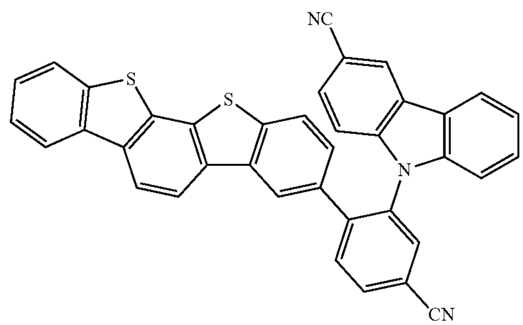
278
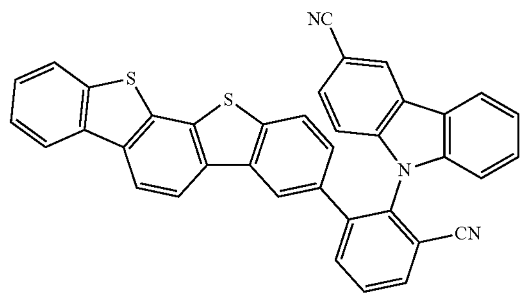
279
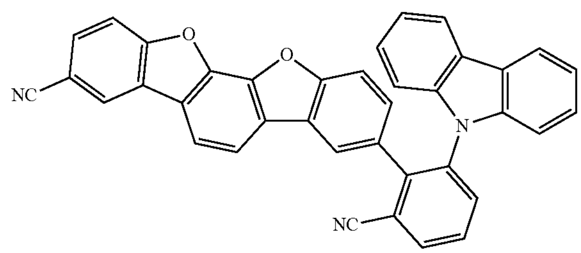
280
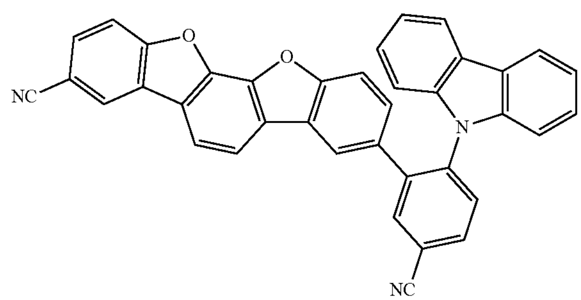
281
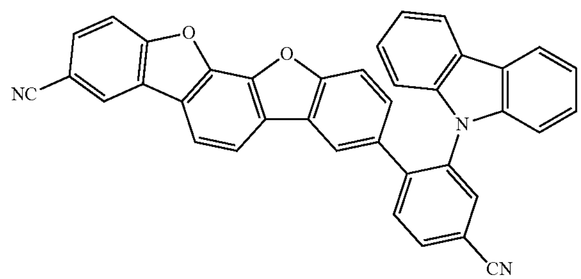
-continued
282
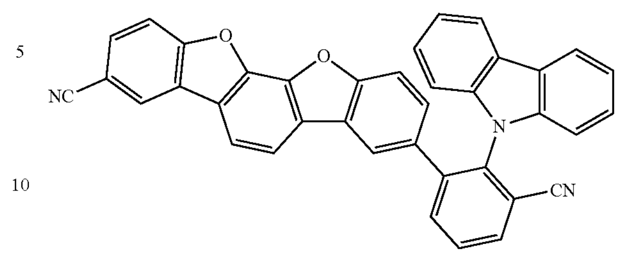
283
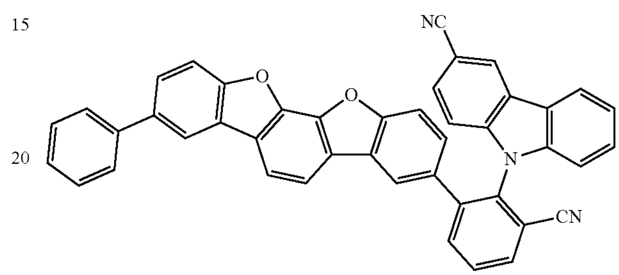
284
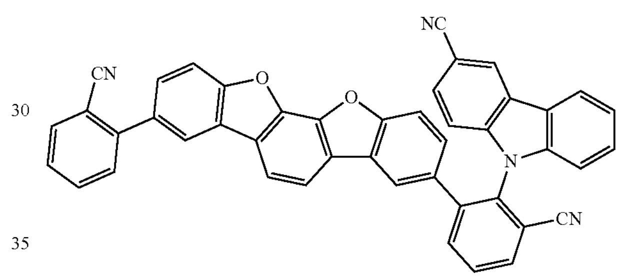
285
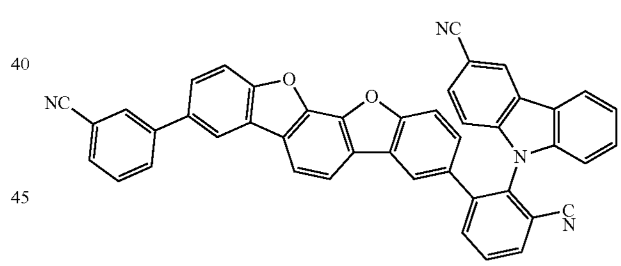
286
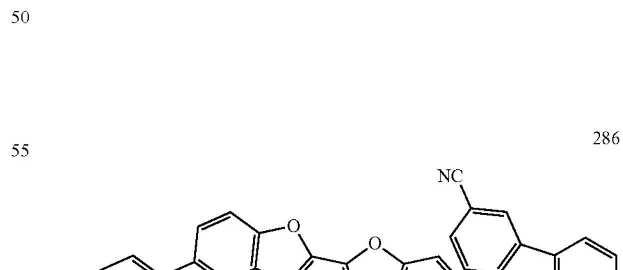
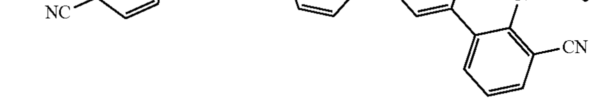

-continued
287
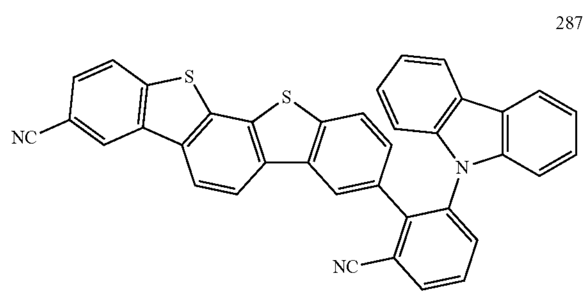
288
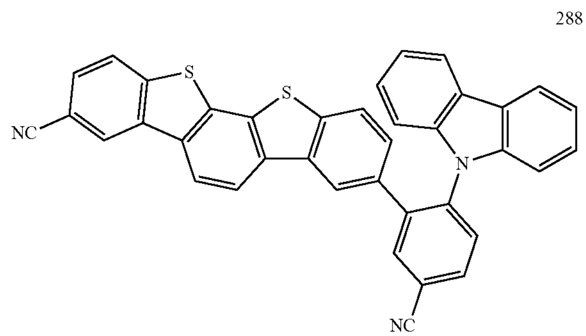
289
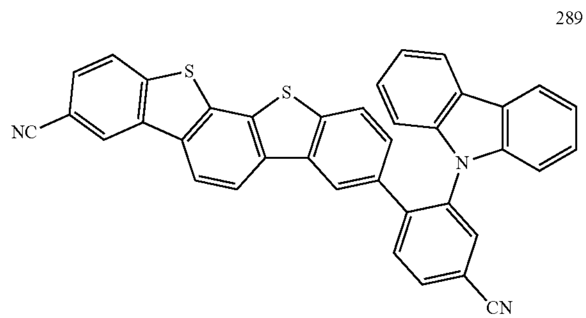
290
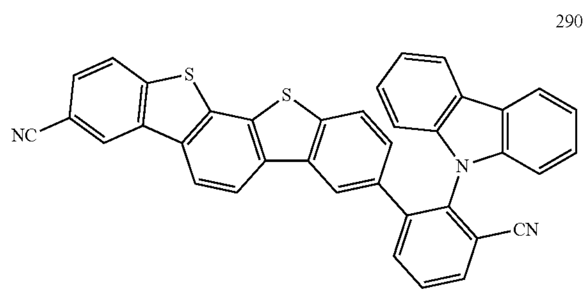
291
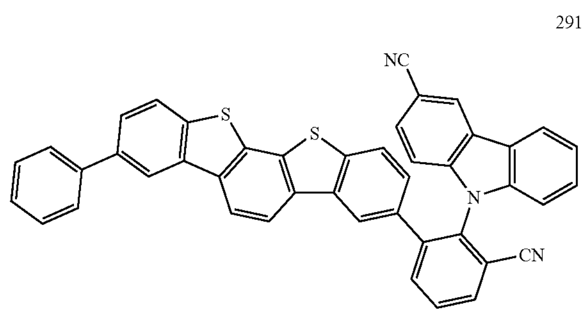
-continued
292
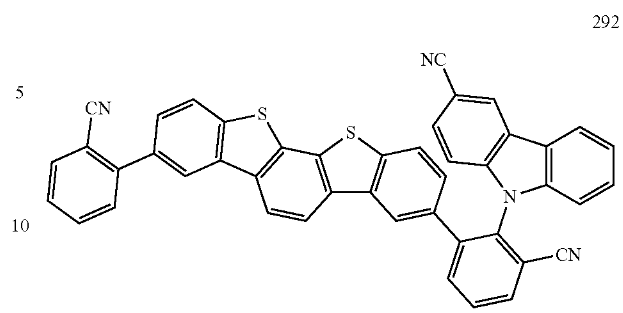
293
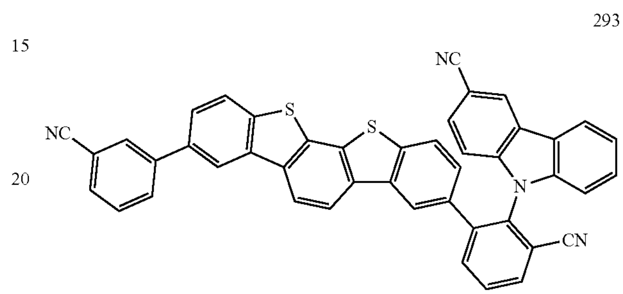
294
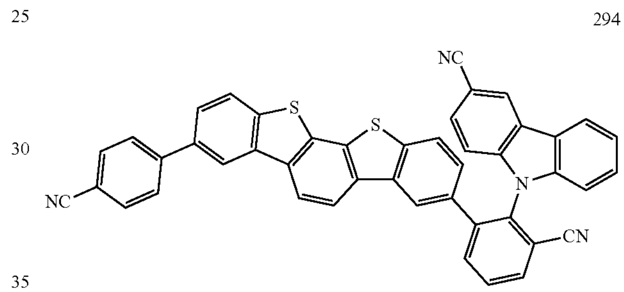
295
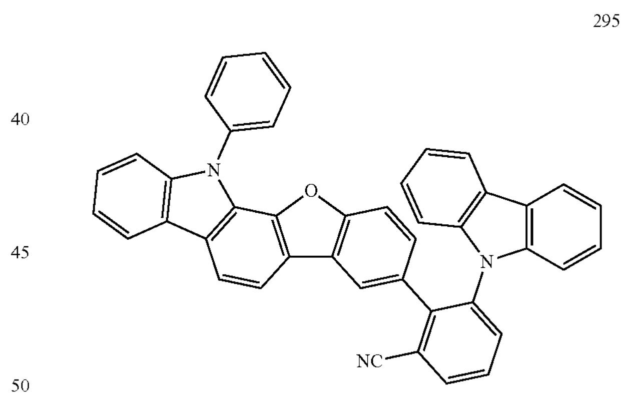
296
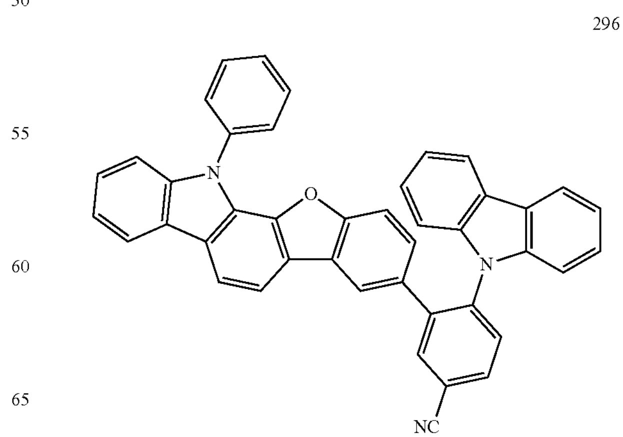

-continued
297
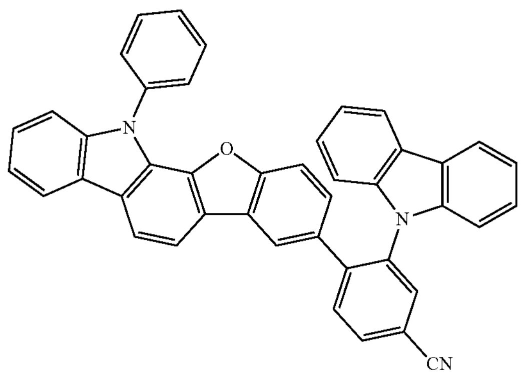
298
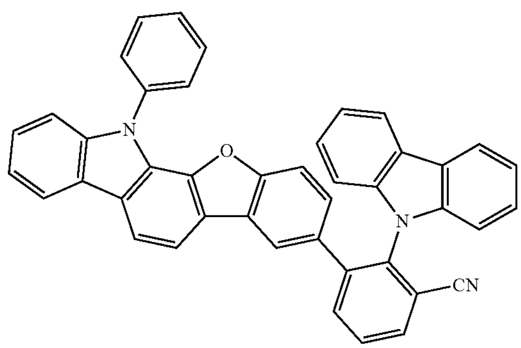
299
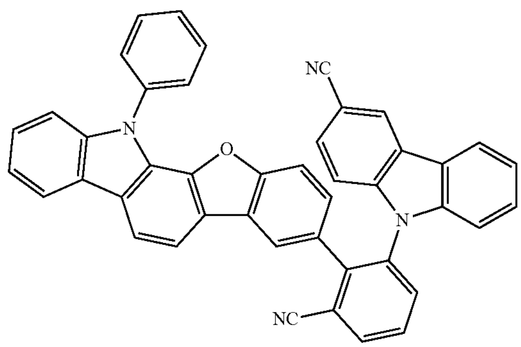
300
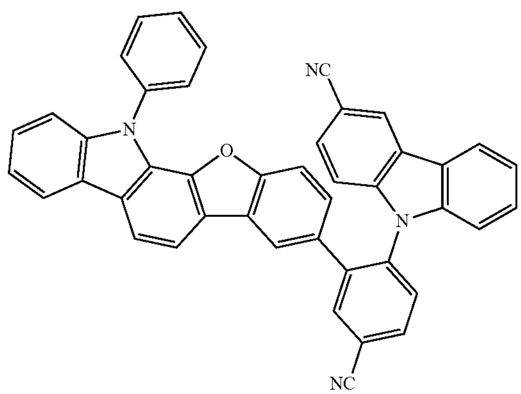
-continued
301
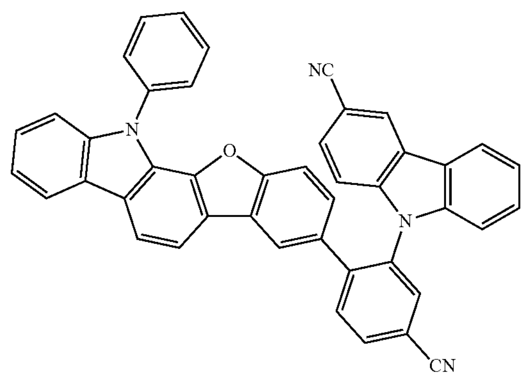
302
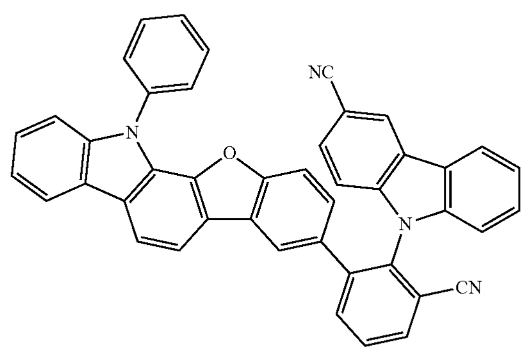
303
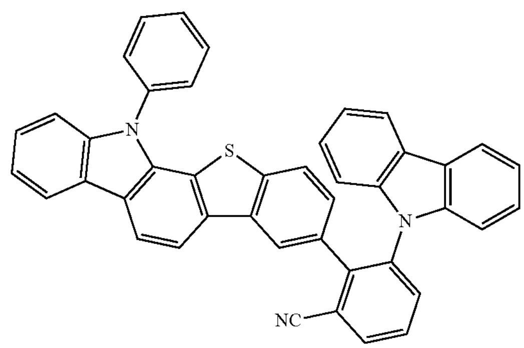
304
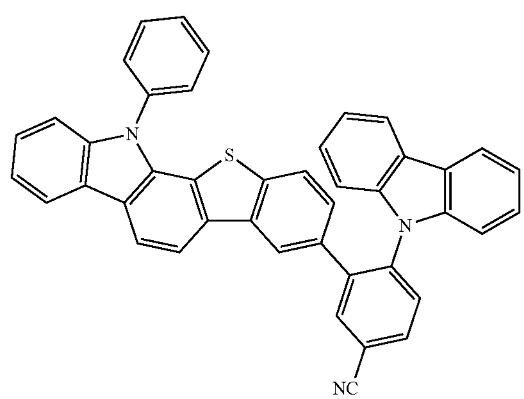

-continued
305
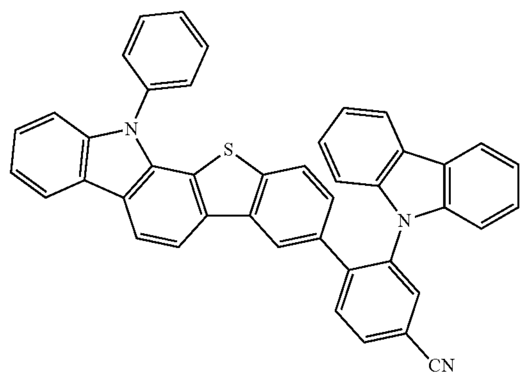
306
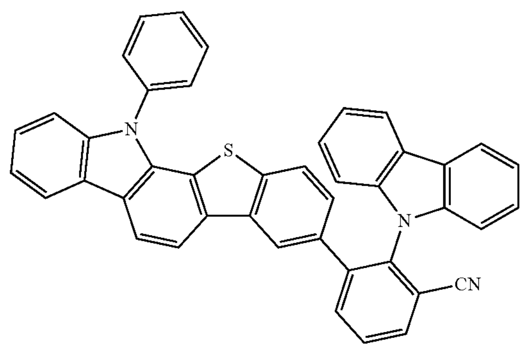
307
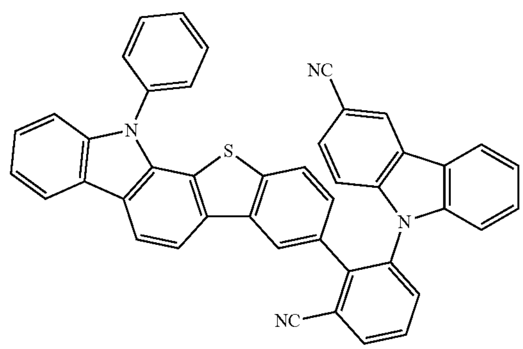
308
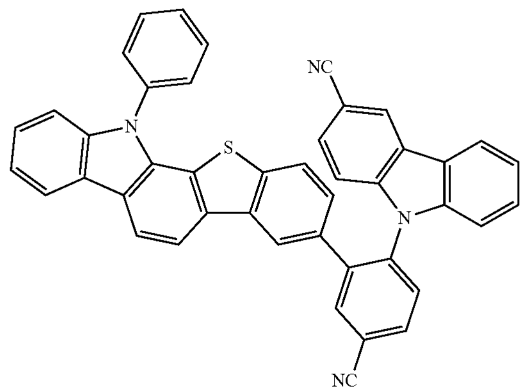
-continued
309
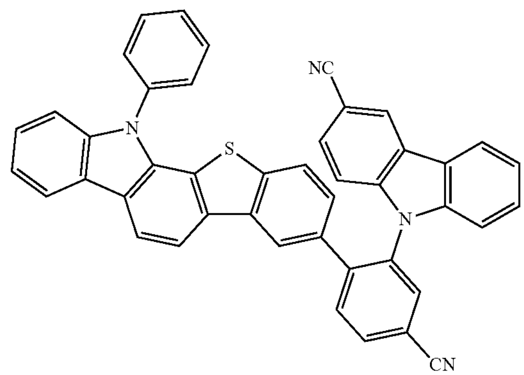
310
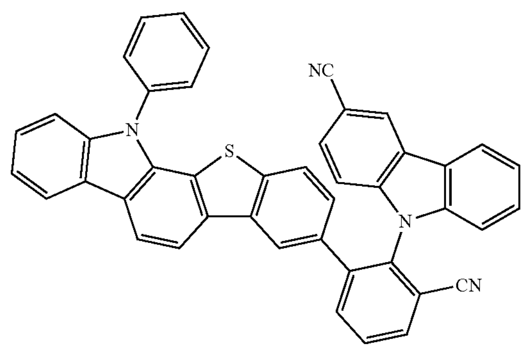
311
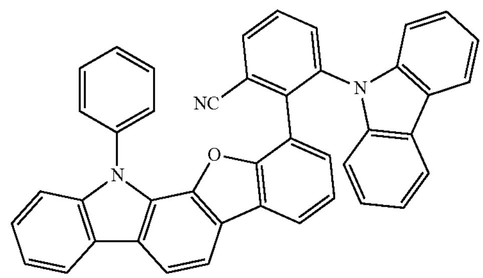
312
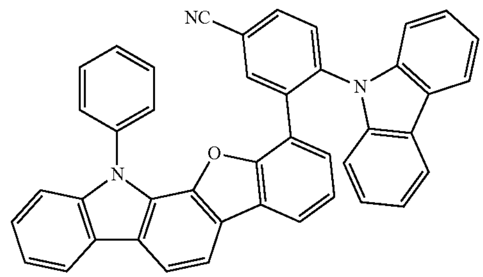
313
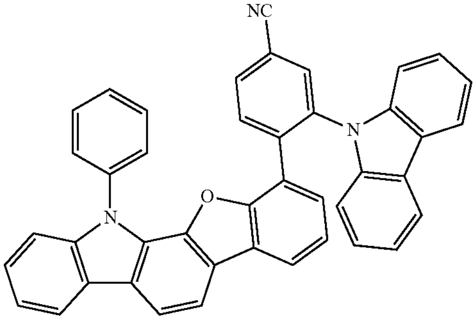

-continued
314
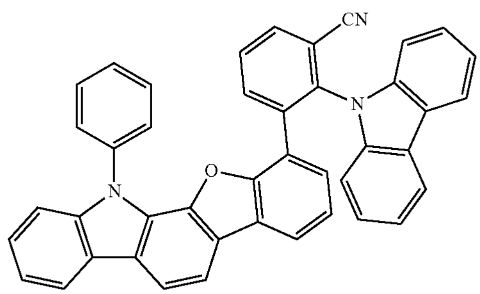
315
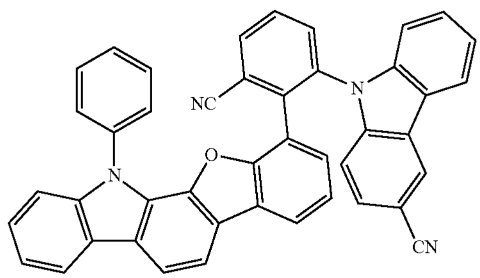
316
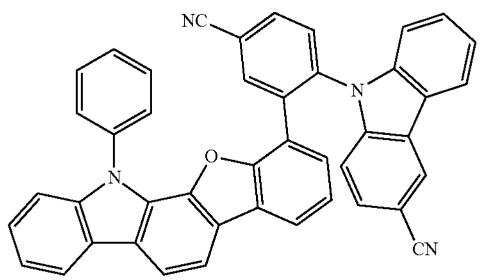
317
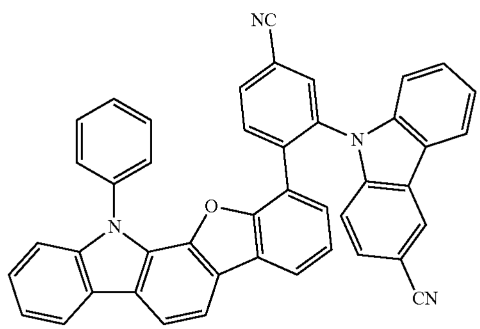
318
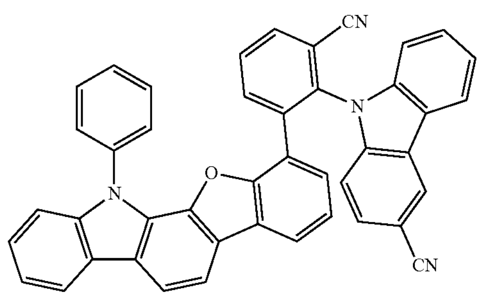
-continued
319
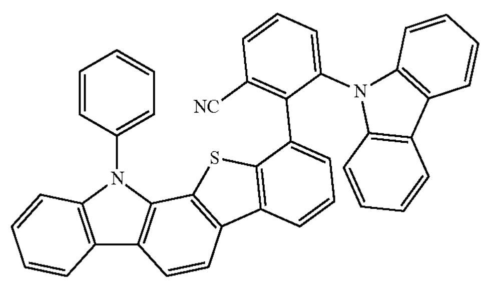
320
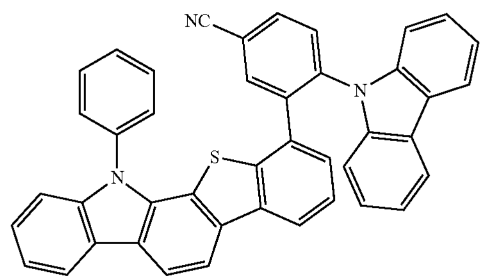
321
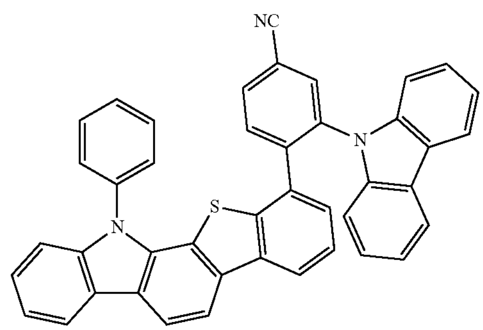
322
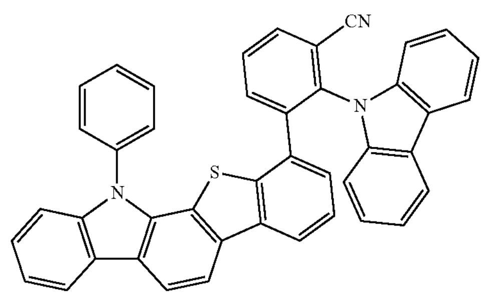
323
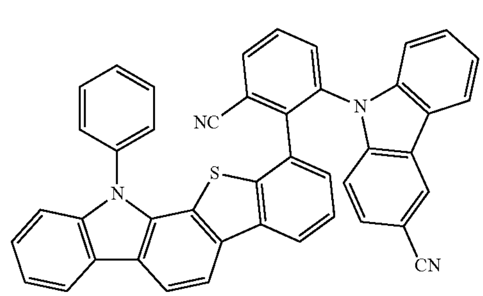

-continued
324
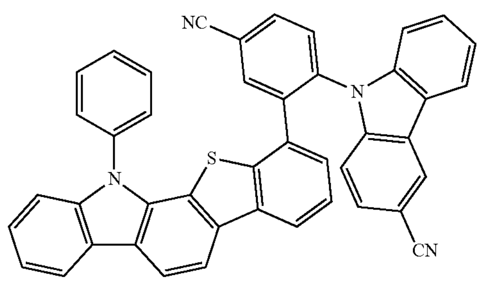
325
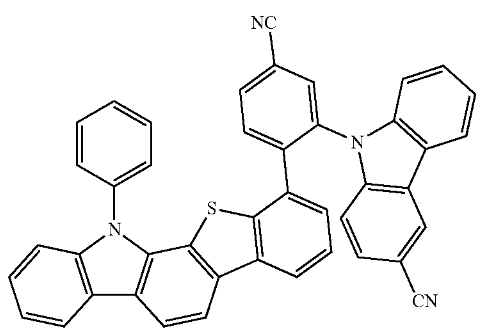
326
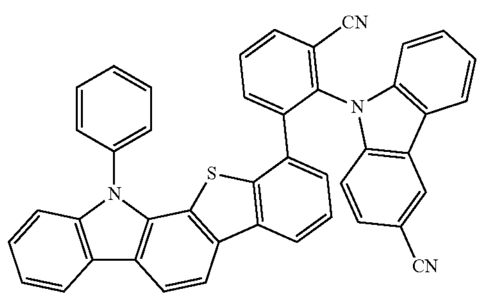
327
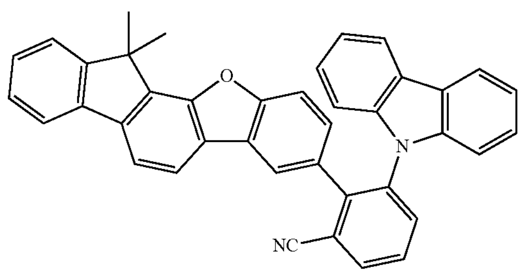
328
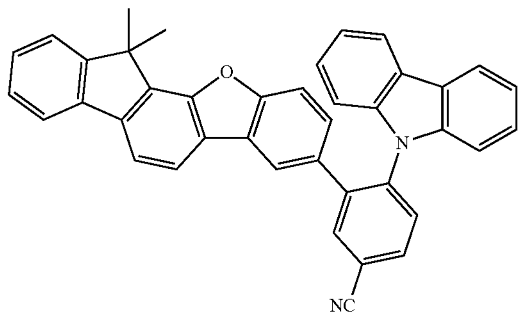
-continued
329
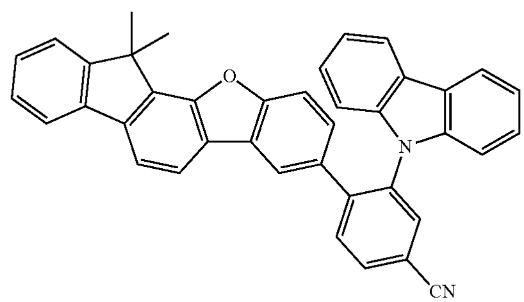
330
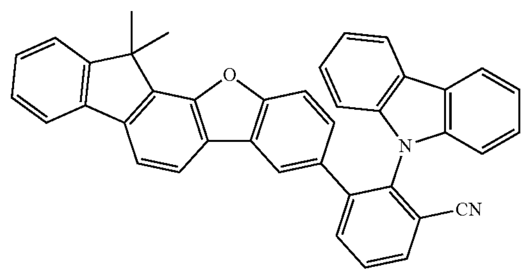
331
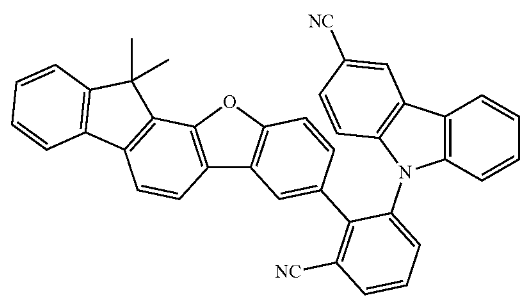
332
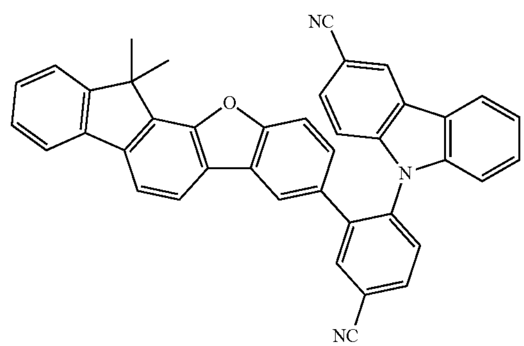
333
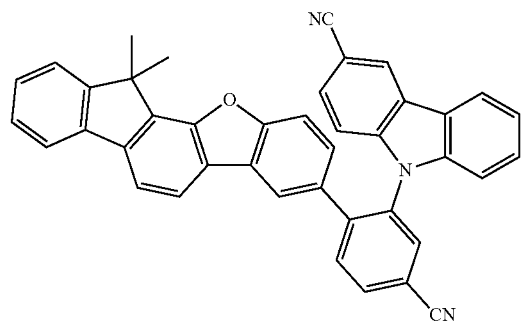

-continued
334
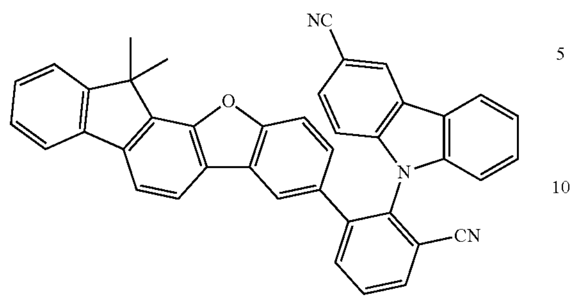
335
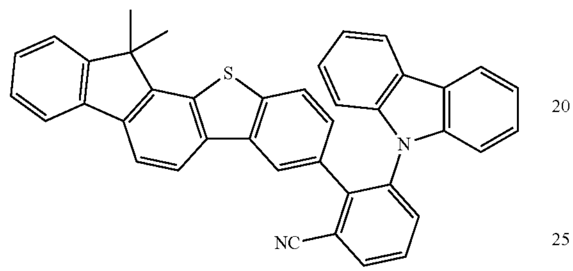
336
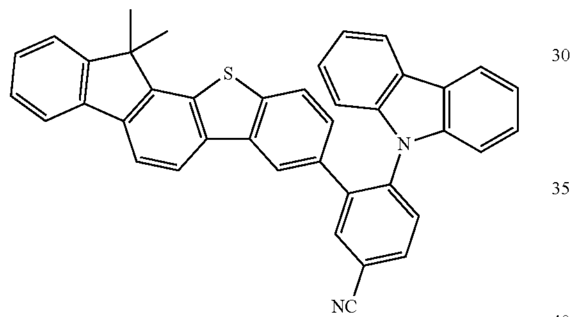
337
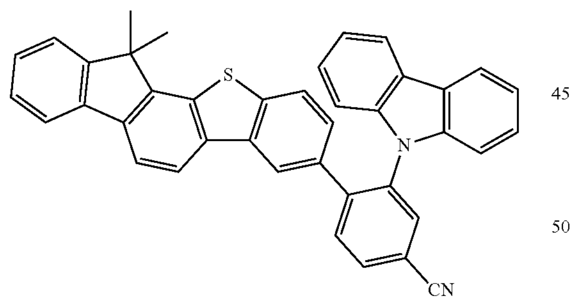
338
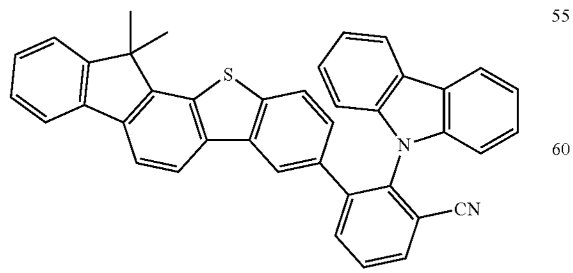
-continued
339
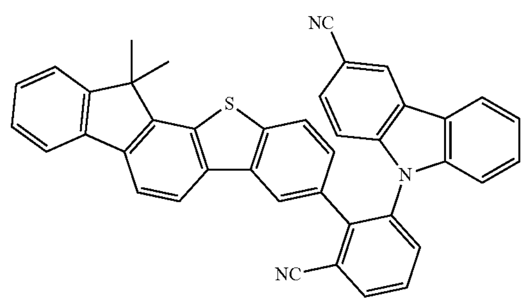
340
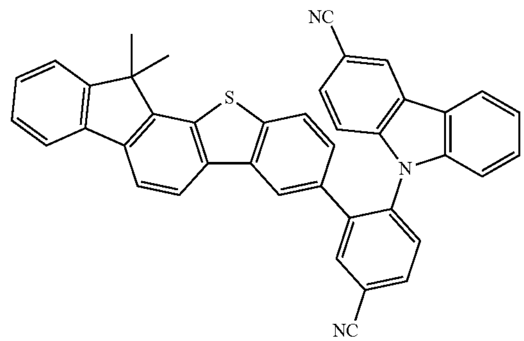
341
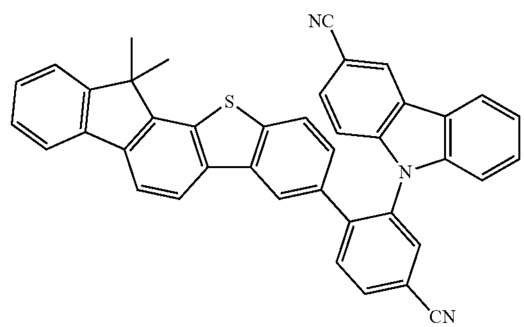
342
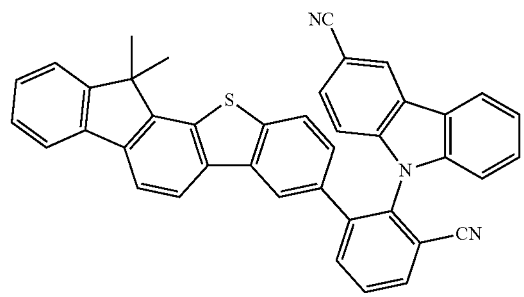

-continued
343
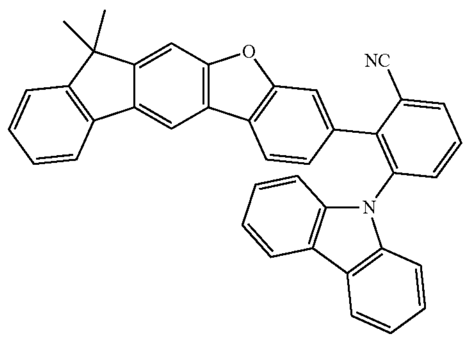
344
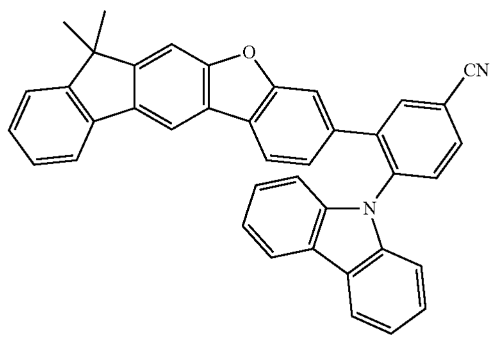
lp;3p
345
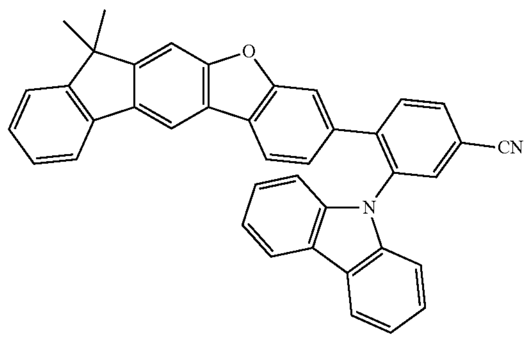
346
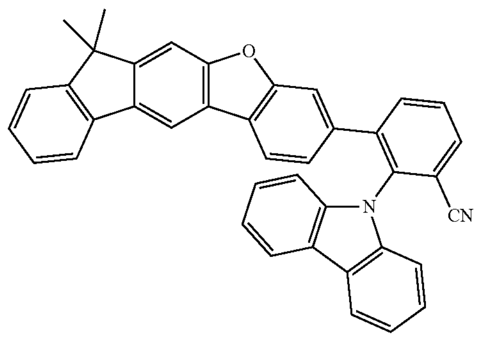
-continued
347
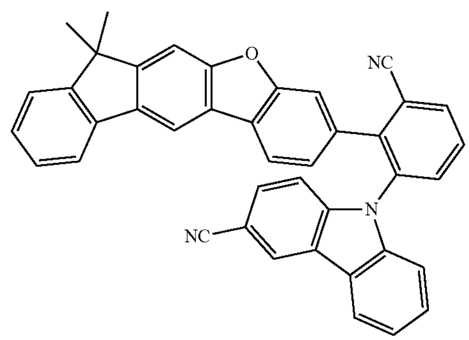
348
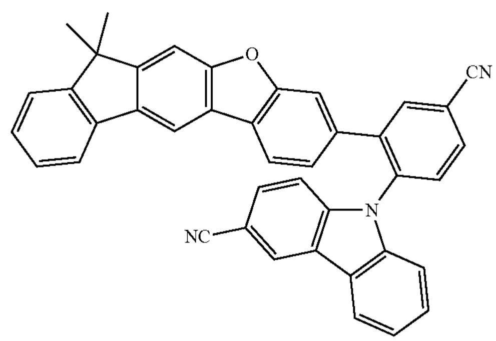
349
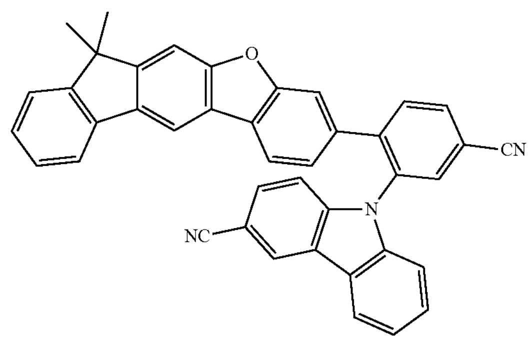
350
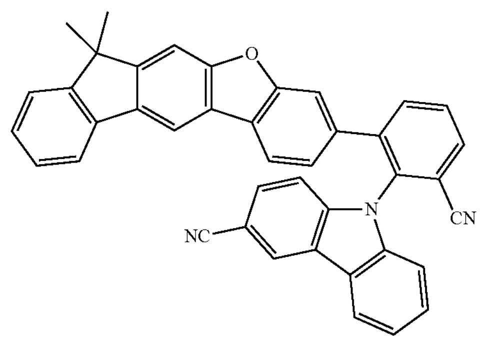

-continued
351
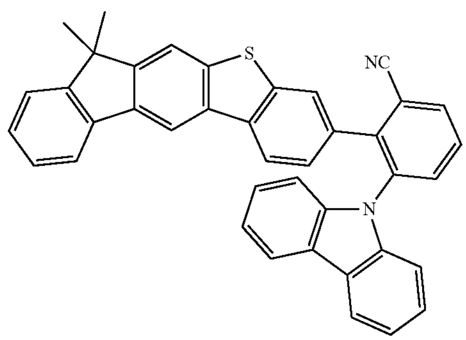
352
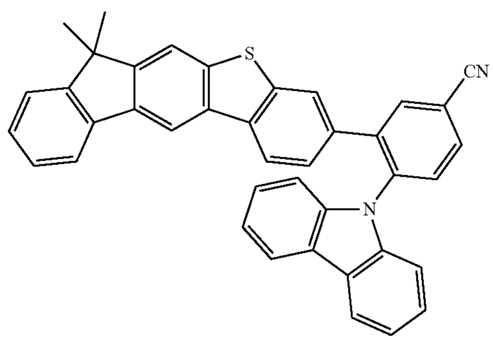
353
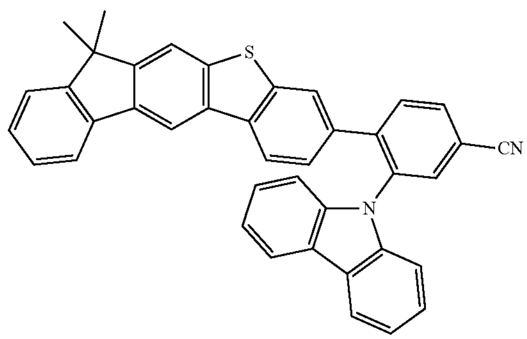
354
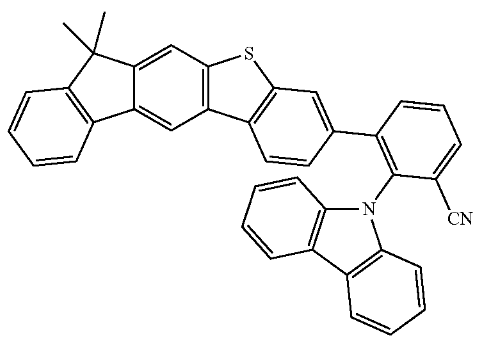
-continued
355
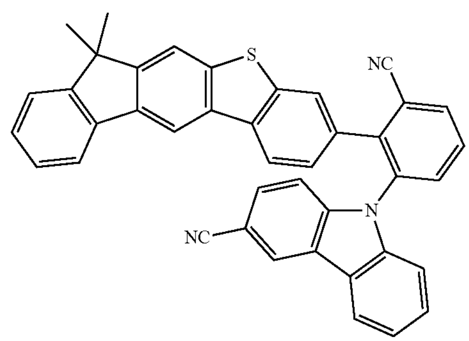
356
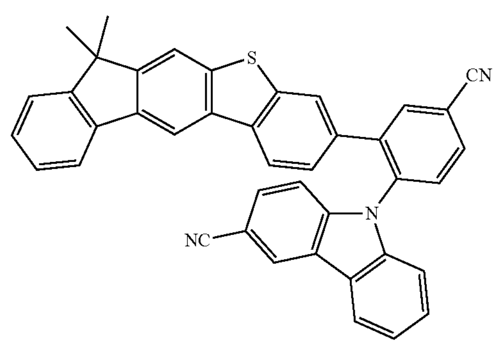
357
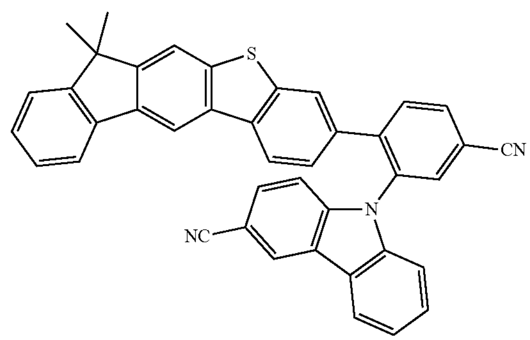
358
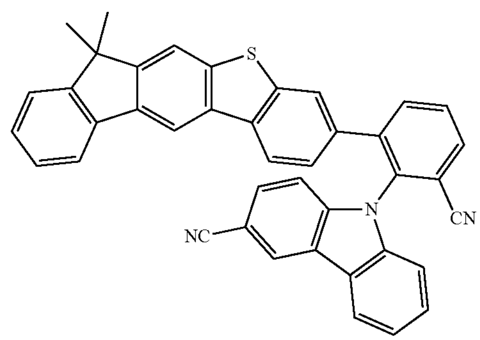

-continued
359
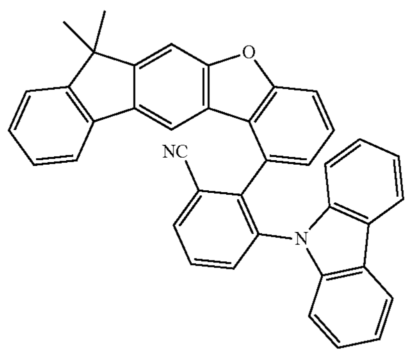
360
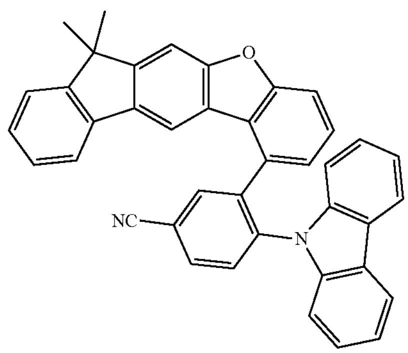
361
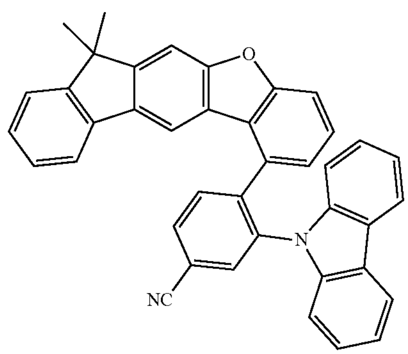
362
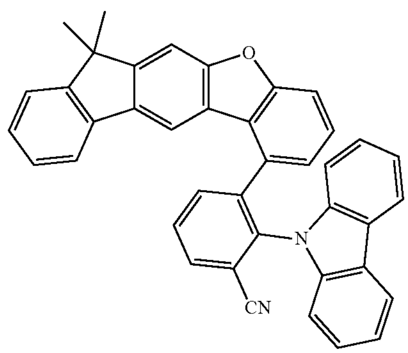
-continued
363
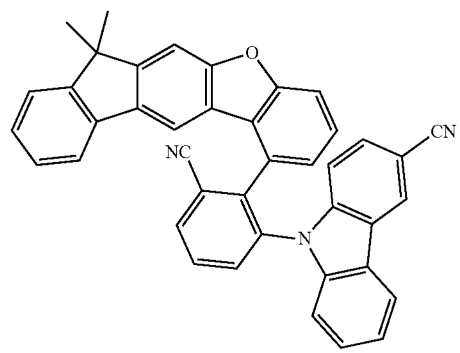
364
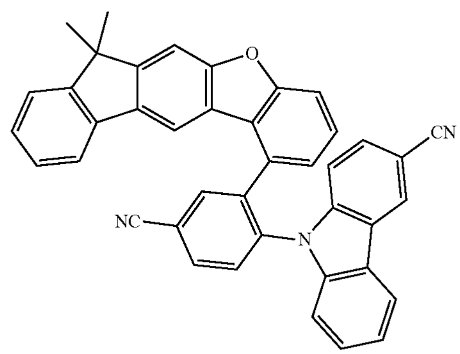
365
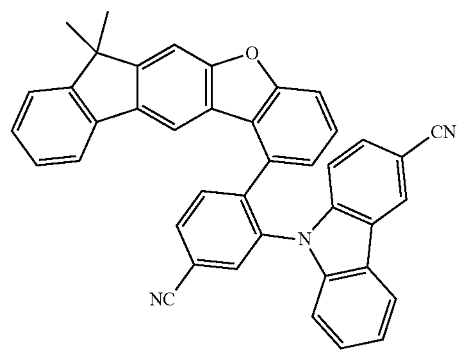
366
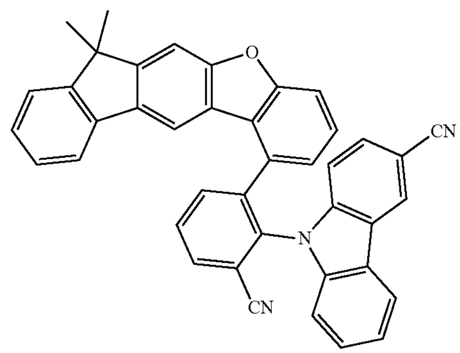

-continued
367
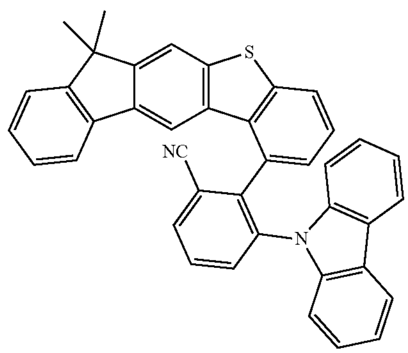
368
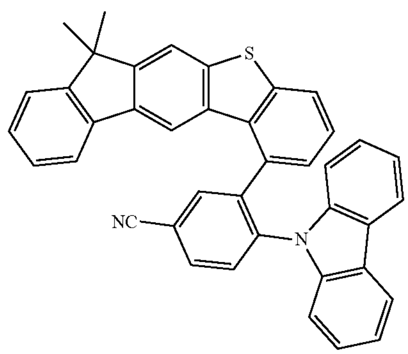
369
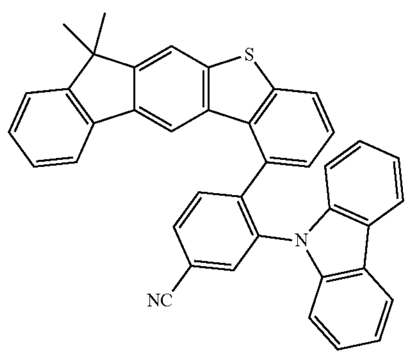
370
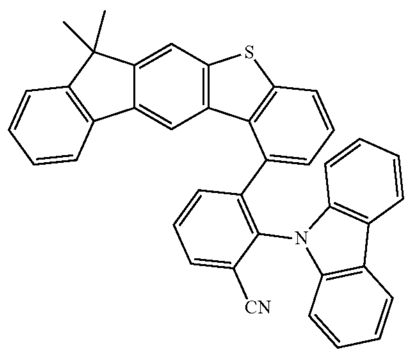
-continued
371
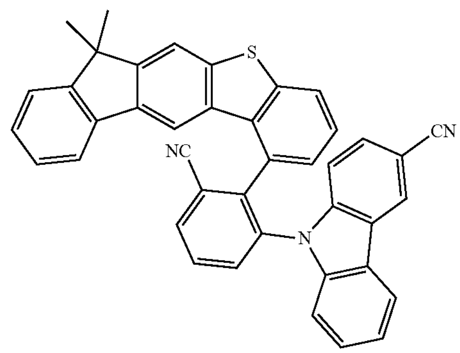
372
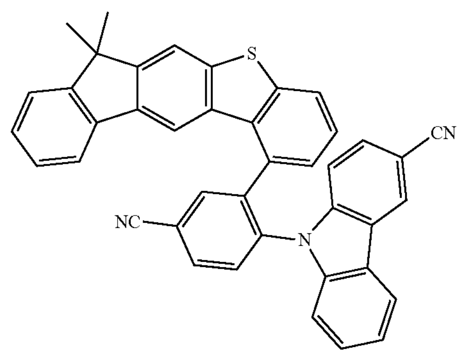
373
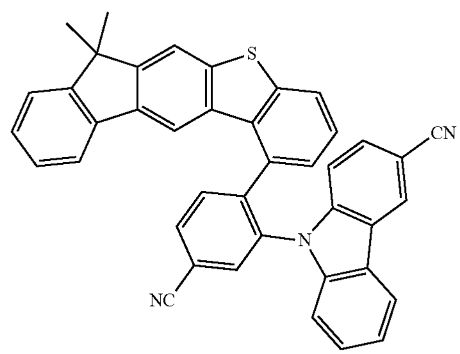
374
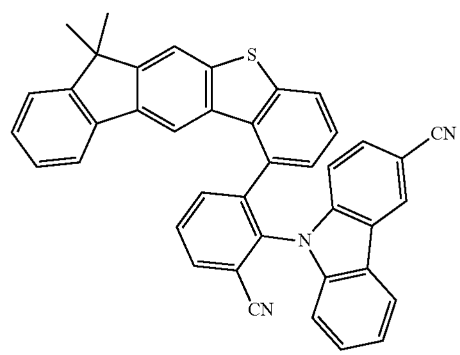

-continued
375
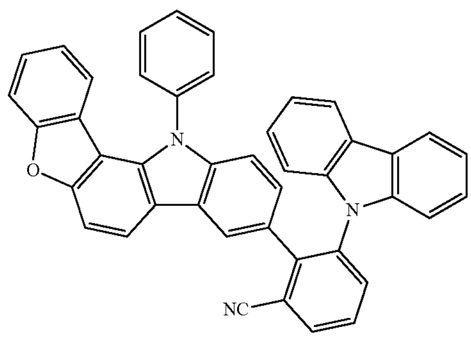
376
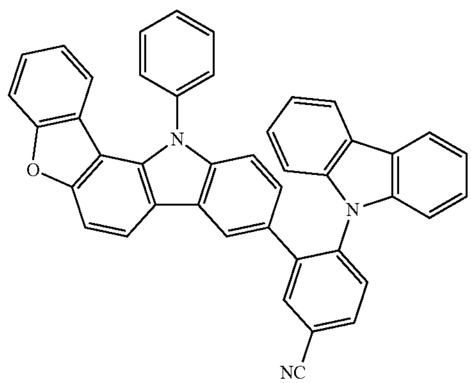
377
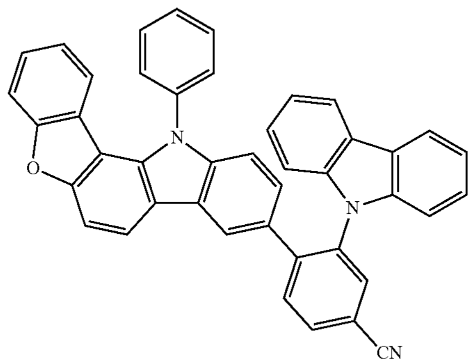
378
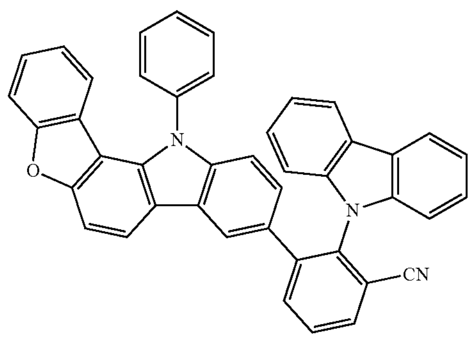
-continued
379
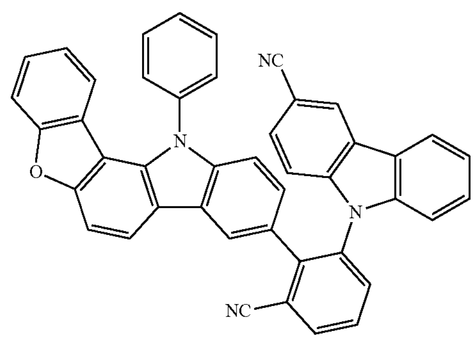
380
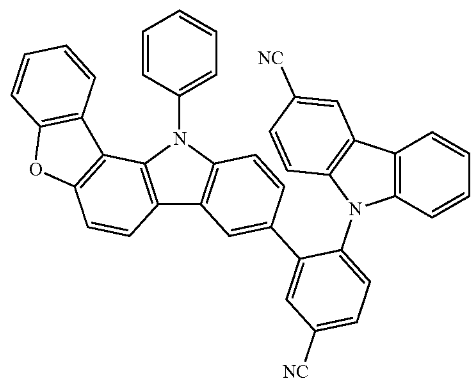
381
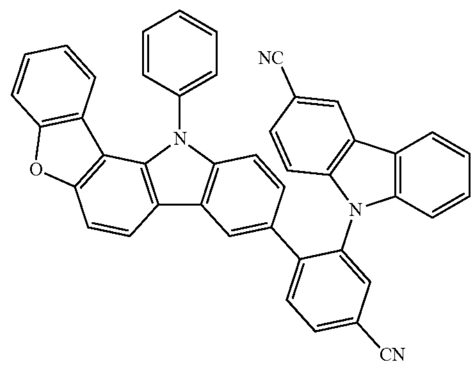
382
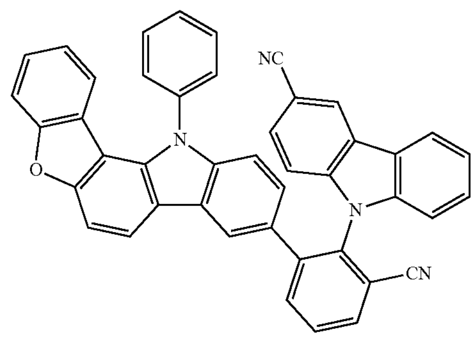

-continued
383
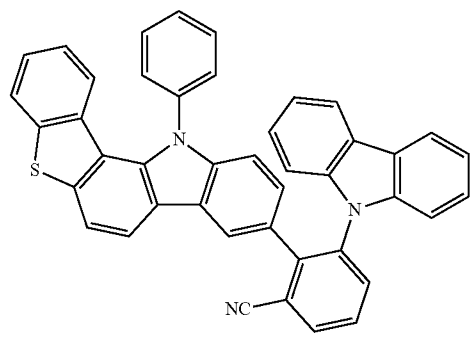
384
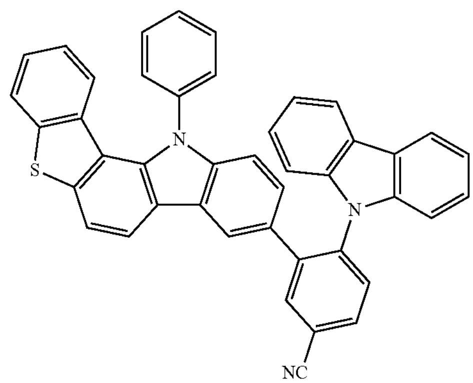
385
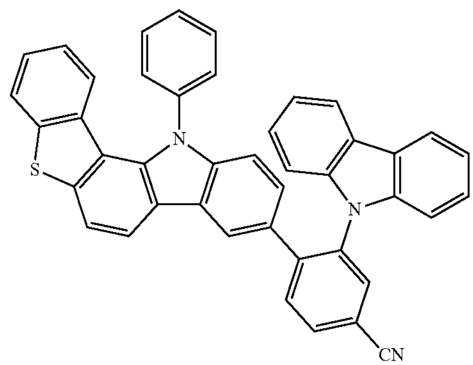
386
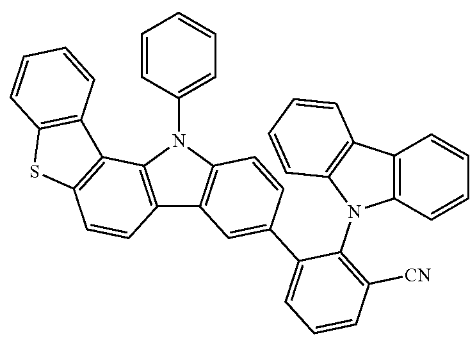
-continued
387
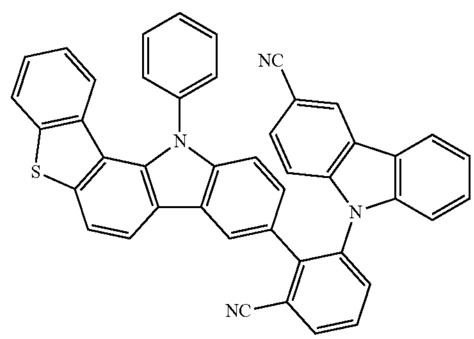
388
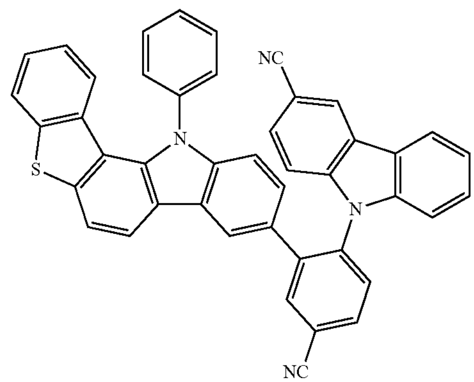
389
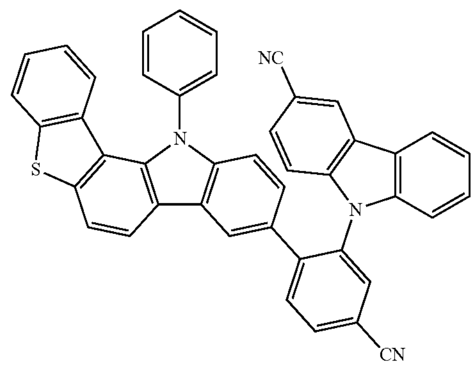
390
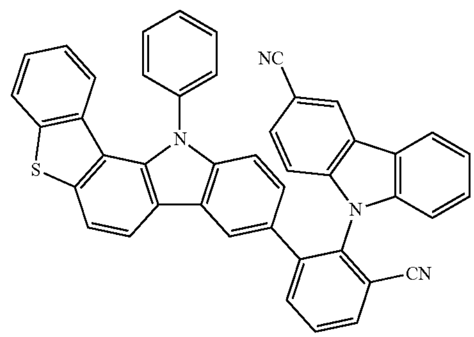

-continued
391
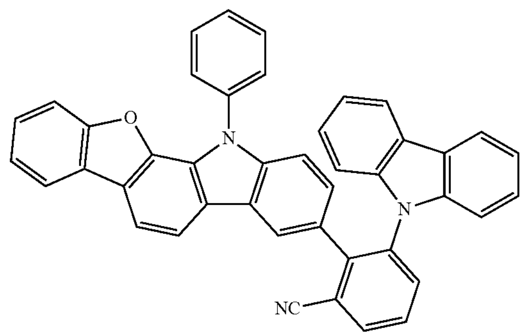
392
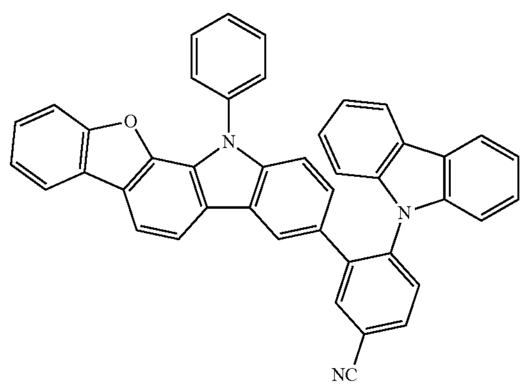
393
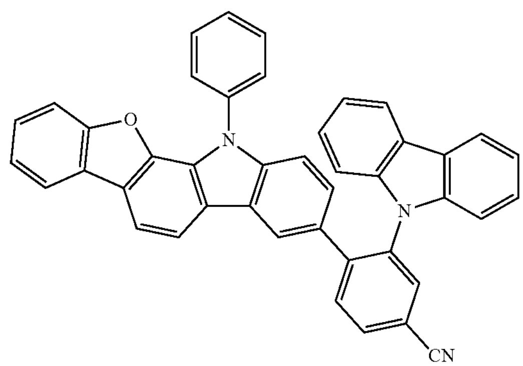
394
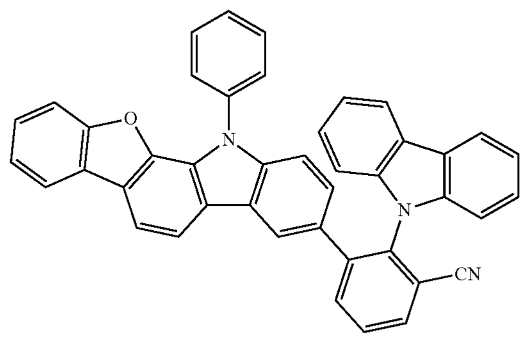
-continued
395
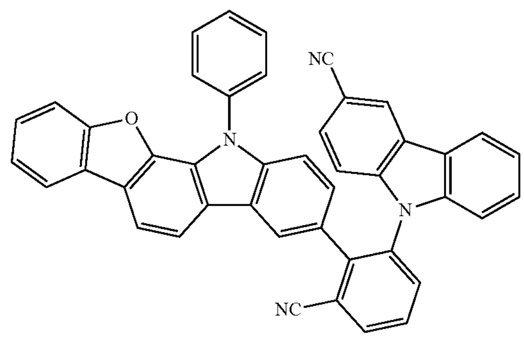
396
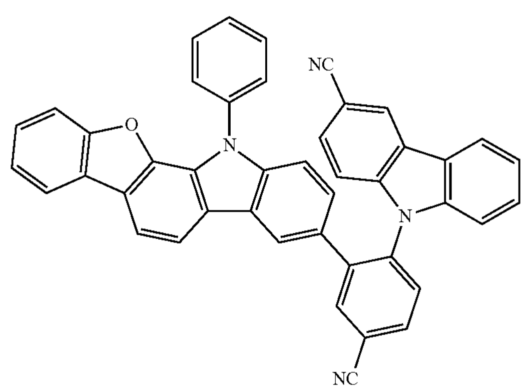
397
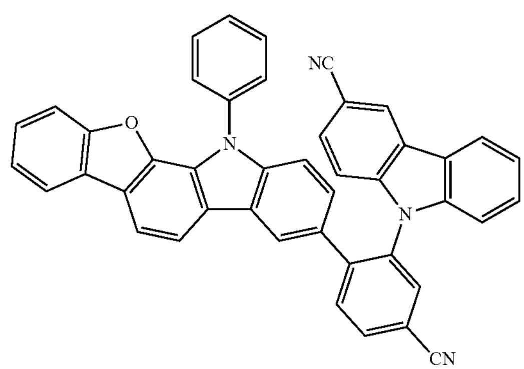
398
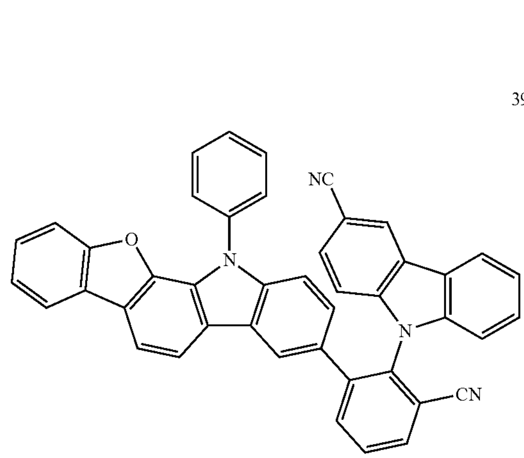

399
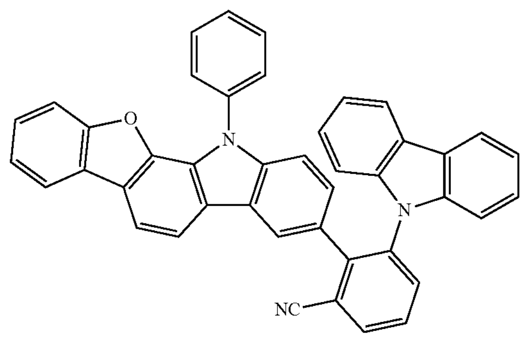
400
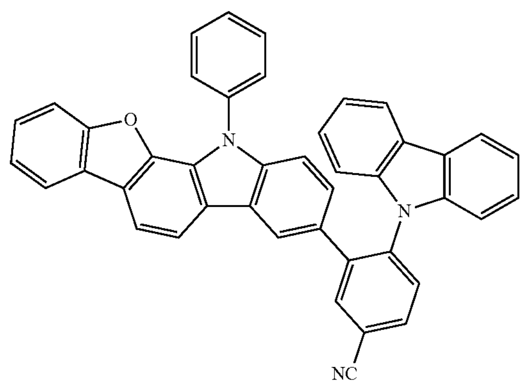
401
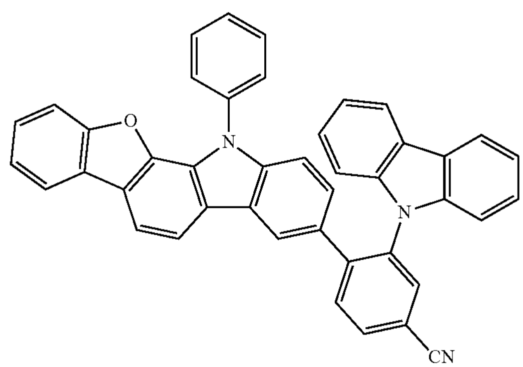
402
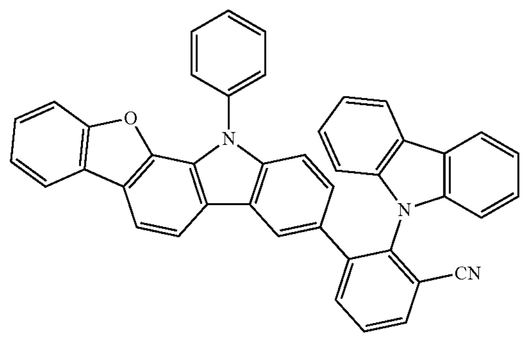
403
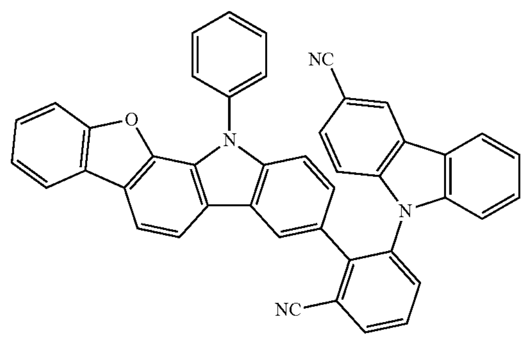
404
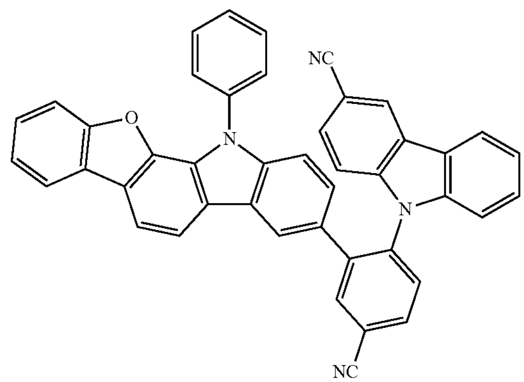
405
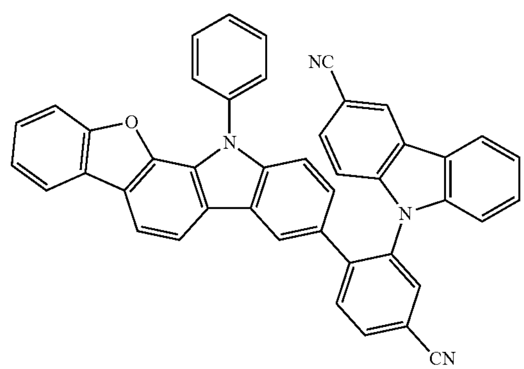
406
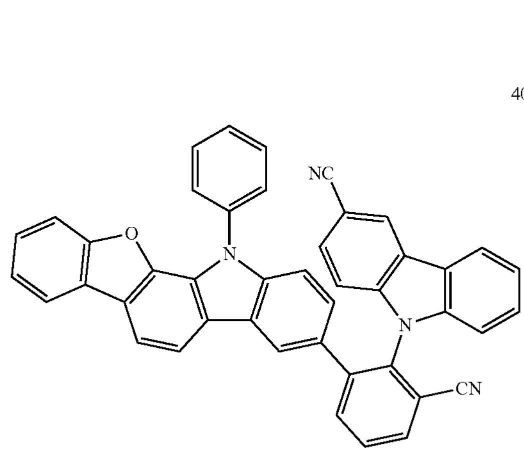

-continued
407
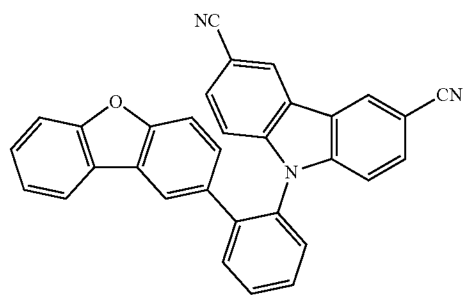
408
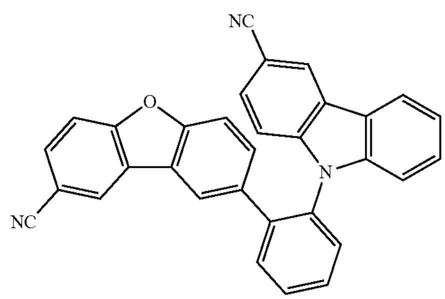
409
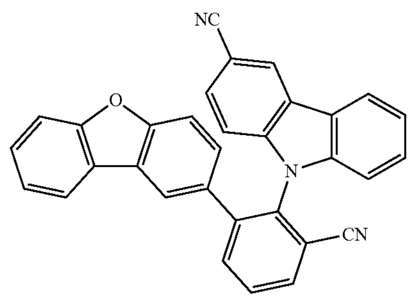
410
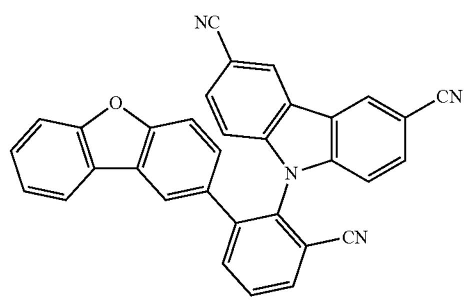
411
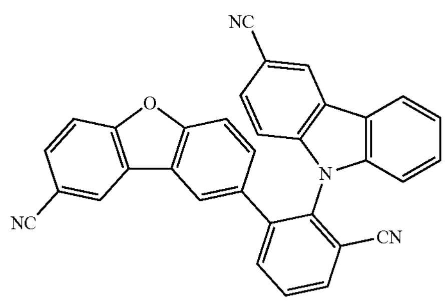
-continued
412
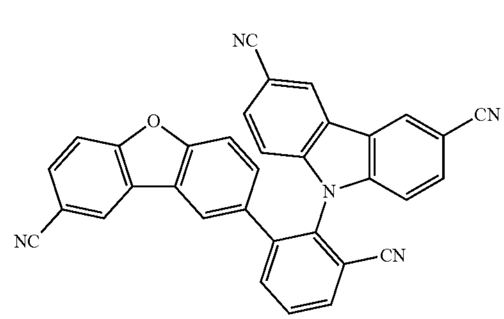
413
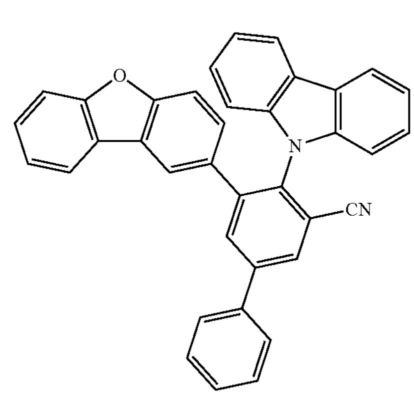
414
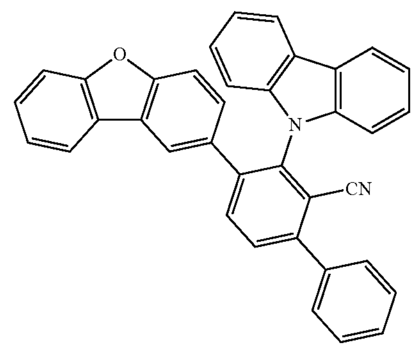
415
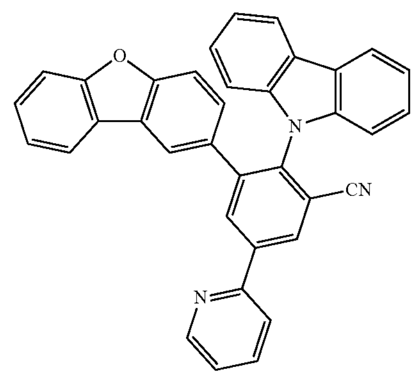

-continued
416
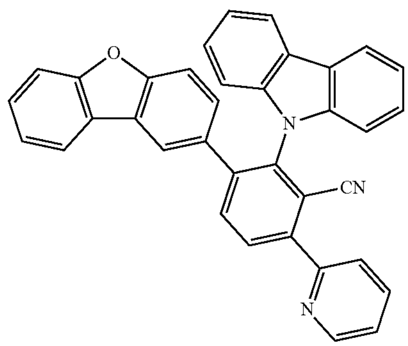
417
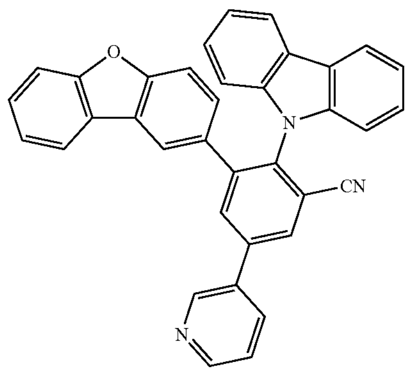
418
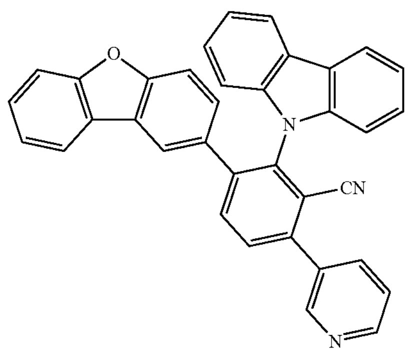
419
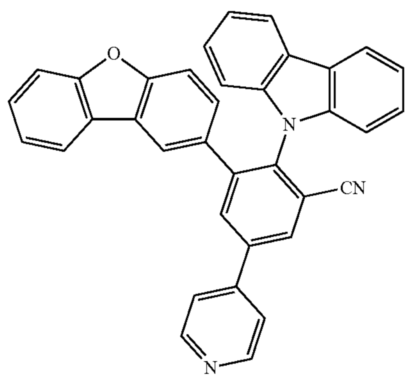
-continued
420
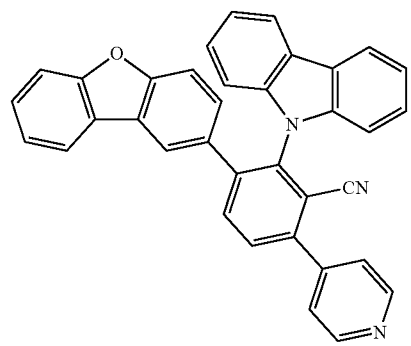
421
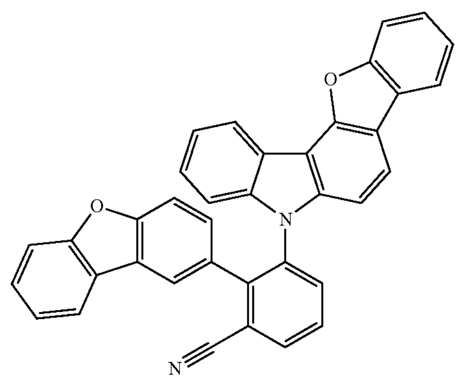
422
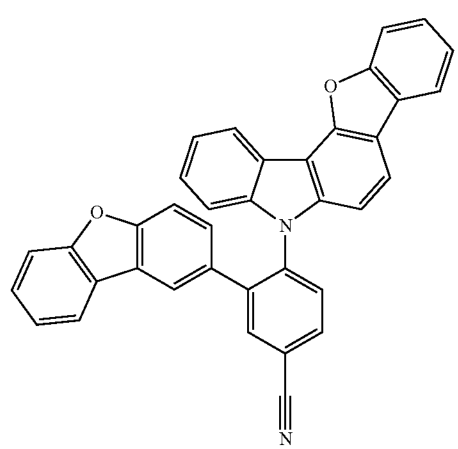
423
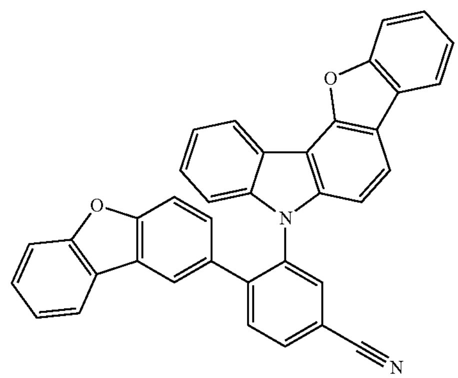

-continued
424
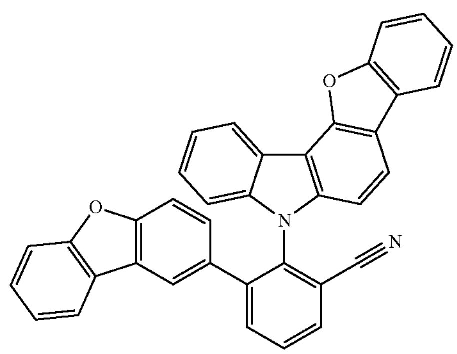
425
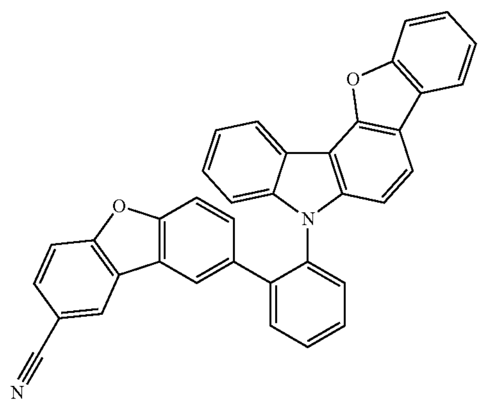
426
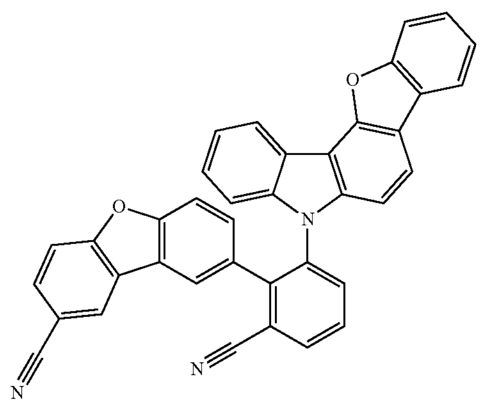
427
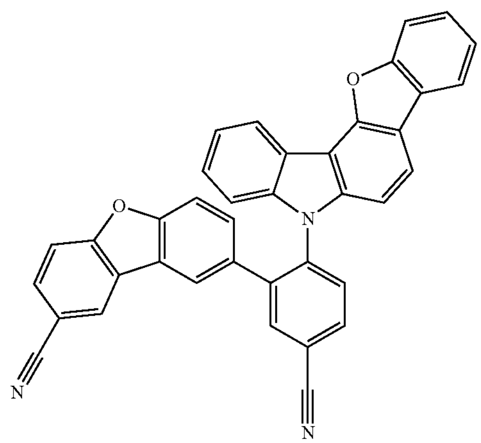
-continued
428
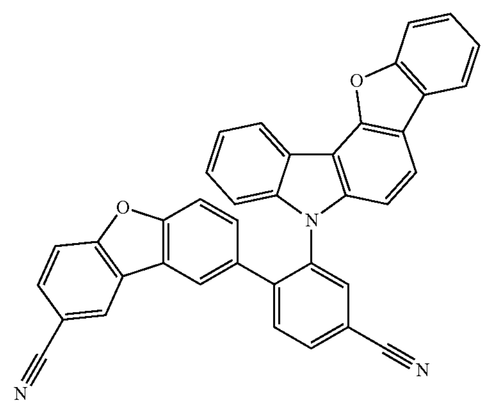
429
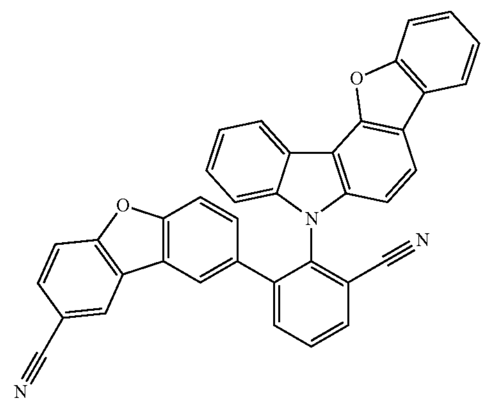
430
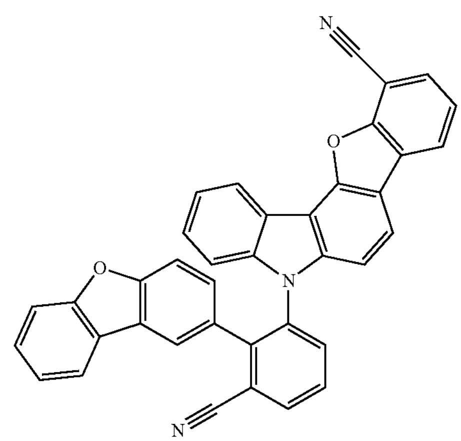

431
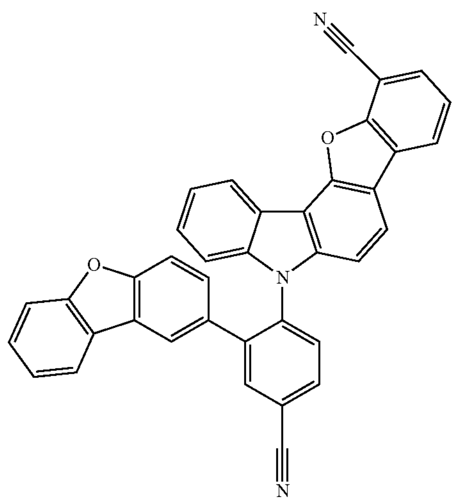
432
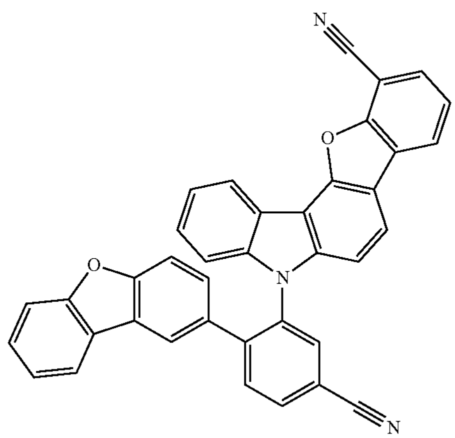
433
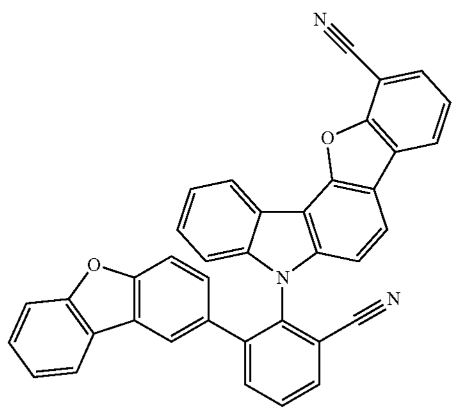
434
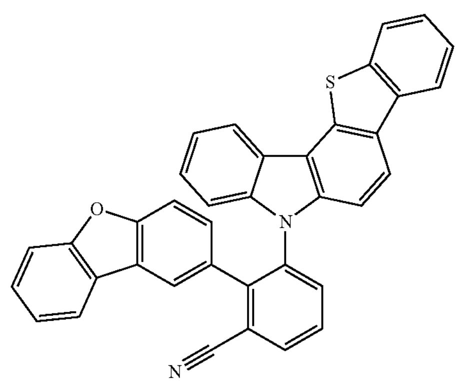
435
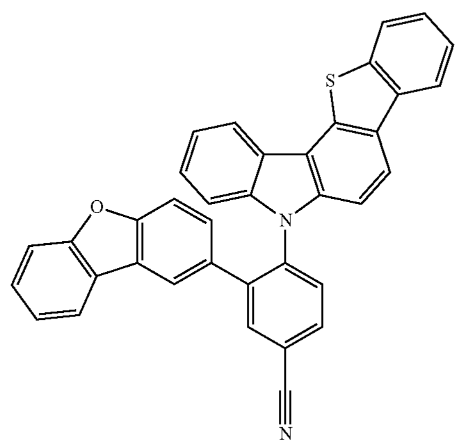
436
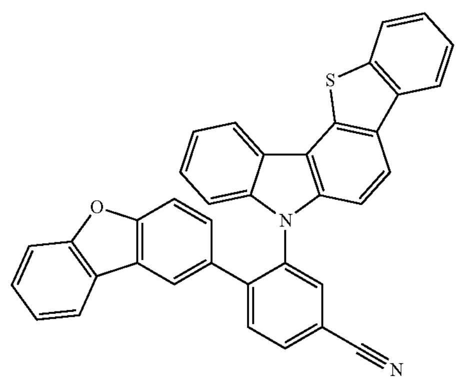
437
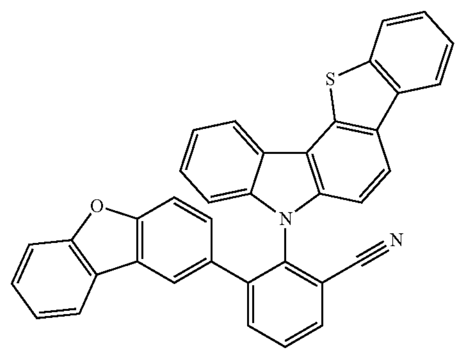

-continued
438
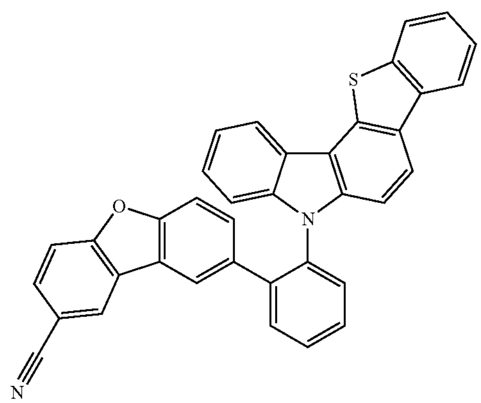
439
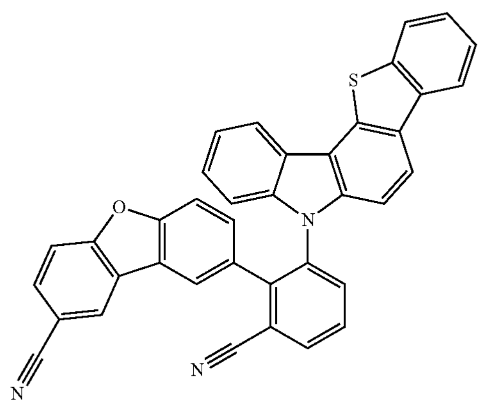
440
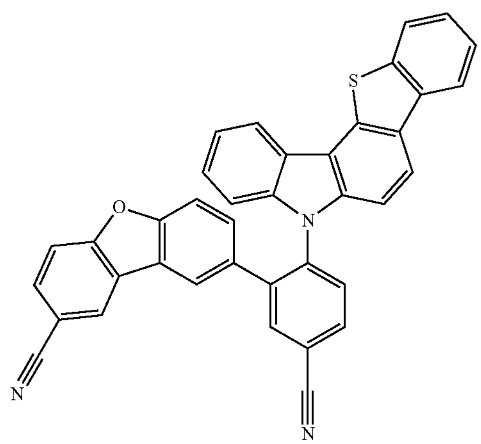
441
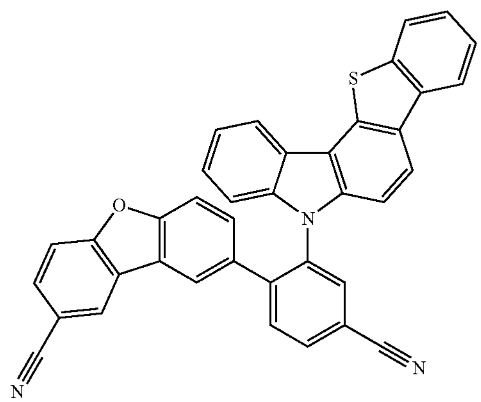
-continued
442
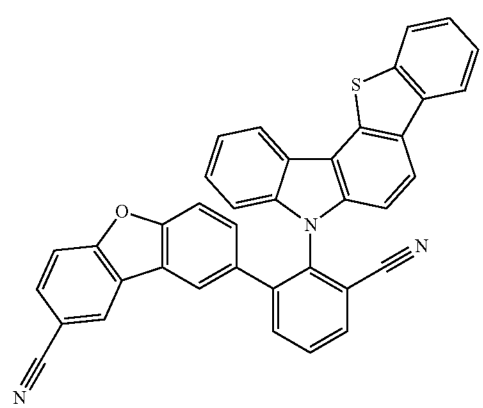
443
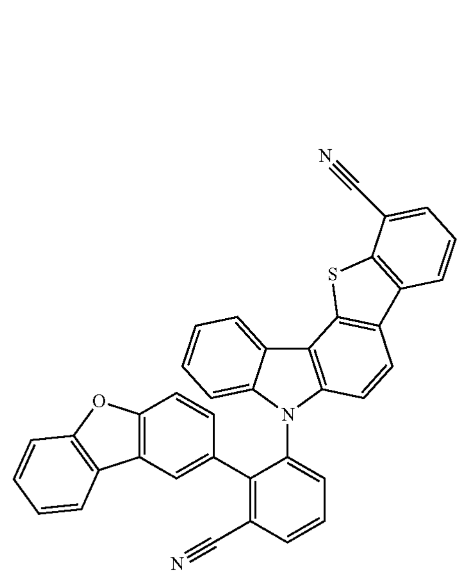
444
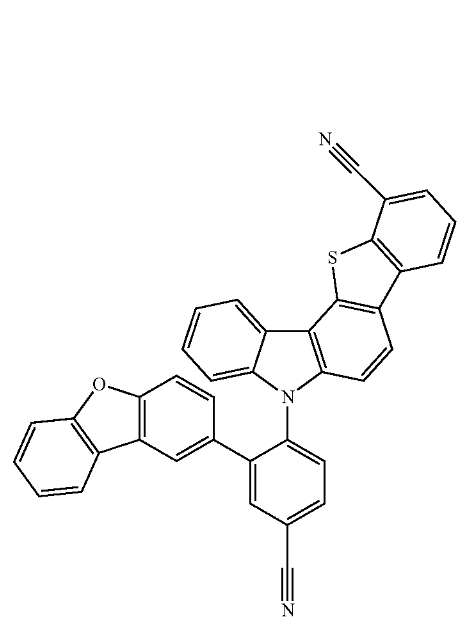

-continued
445
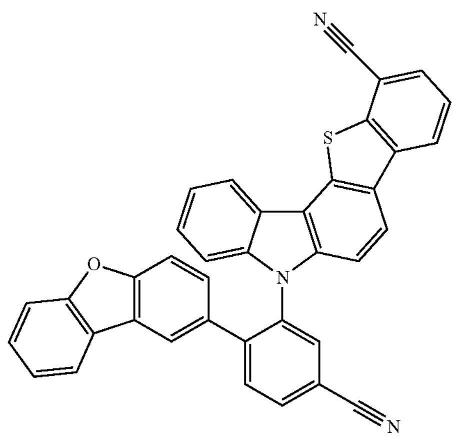
446
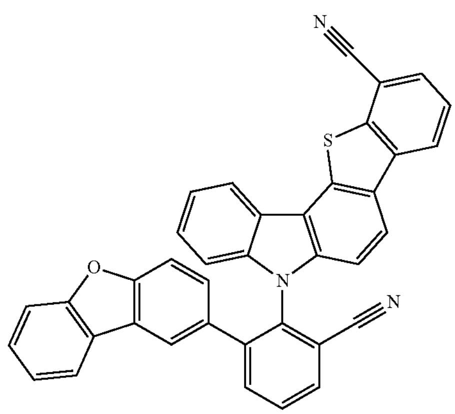
447
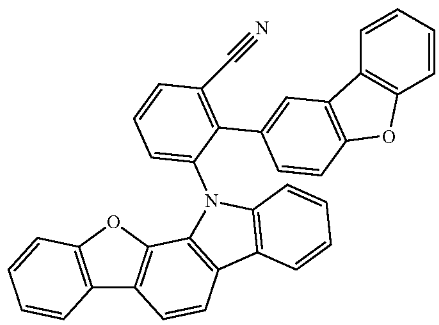
448
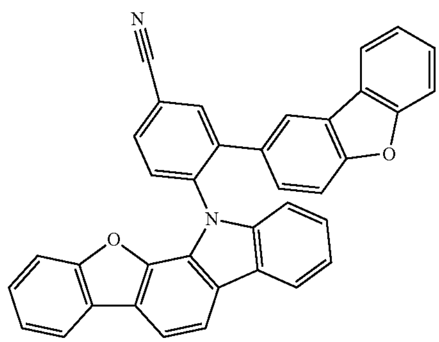
-continued
449
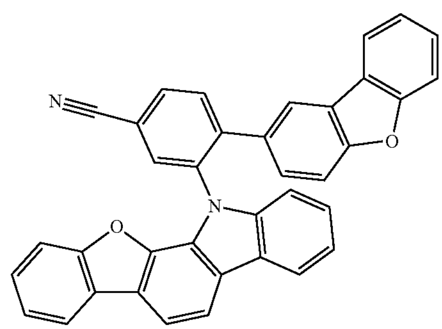
450
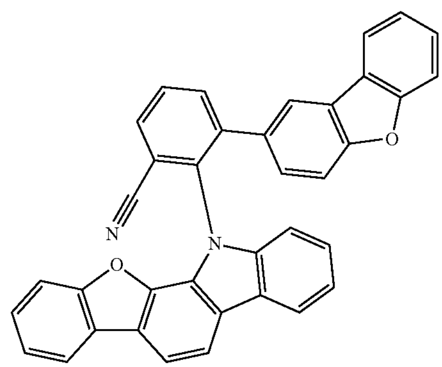
451
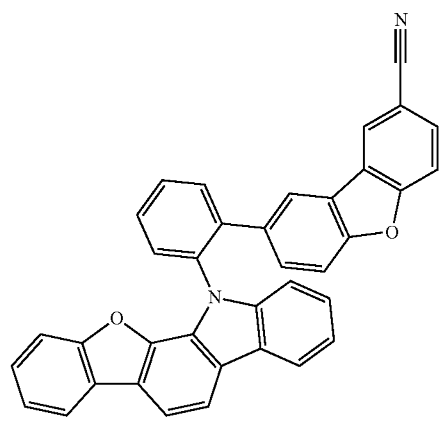
452
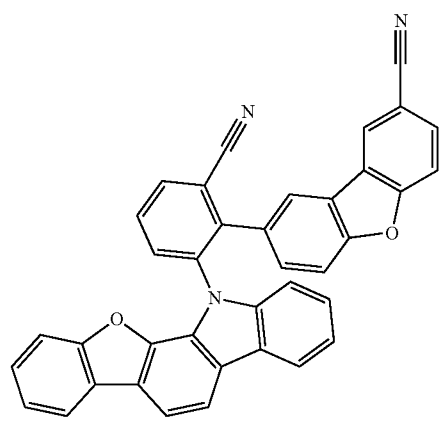

453
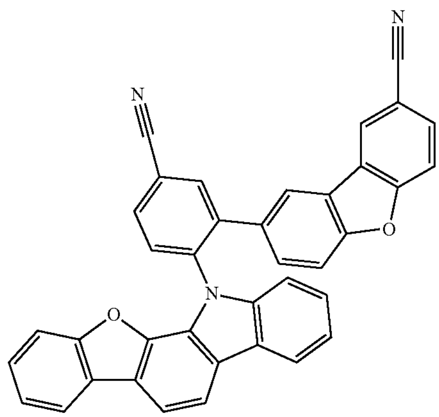
454
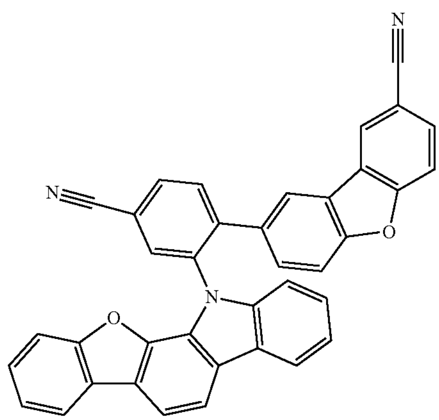
455
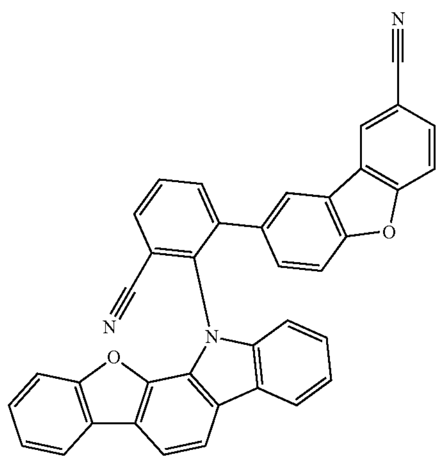
456
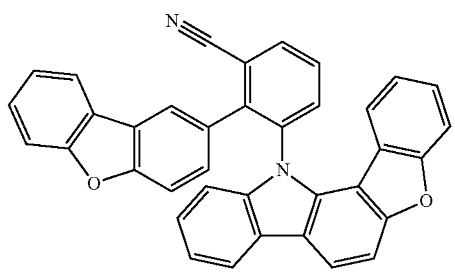
457
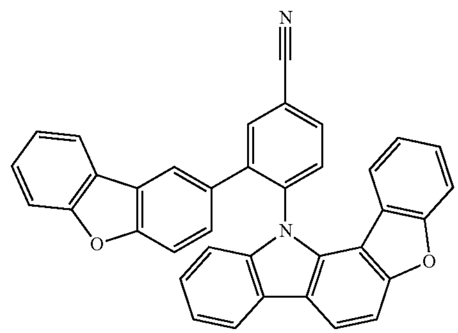
458
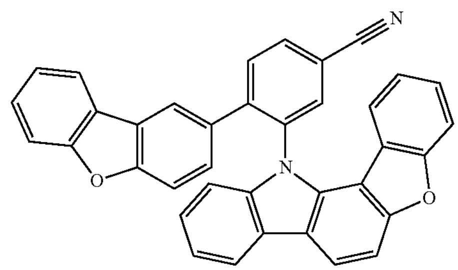
459
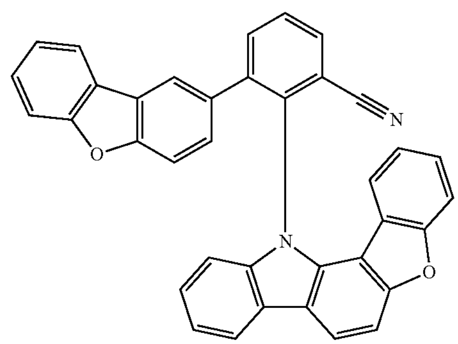
460
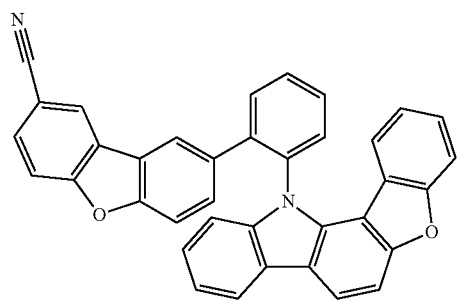
461
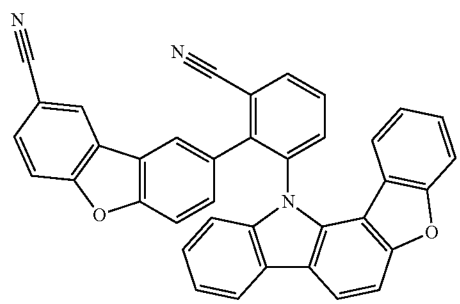

-continued
462
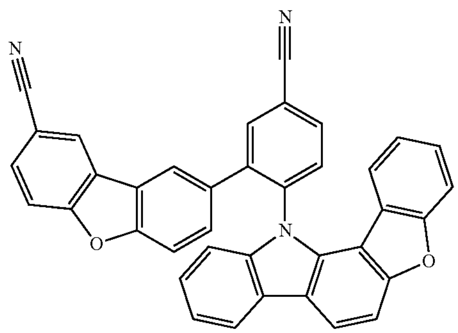
463
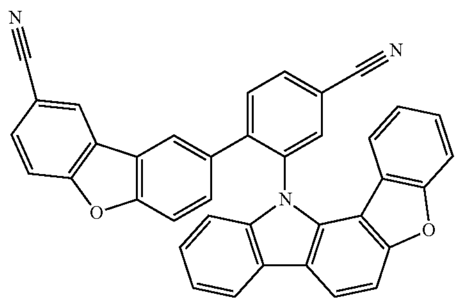
464
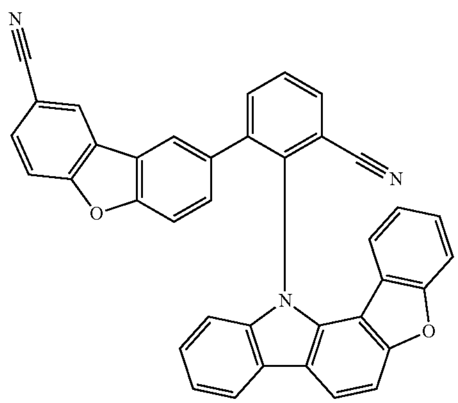
465
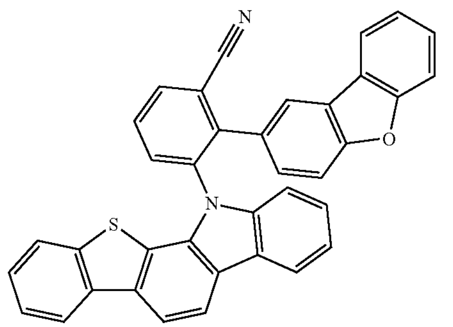
-continued
466
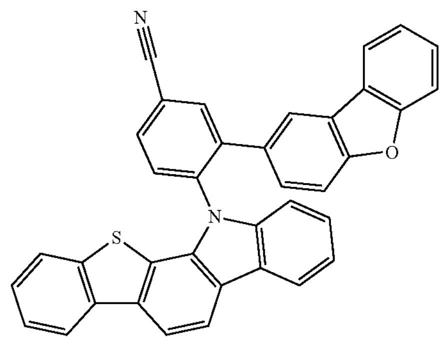
467
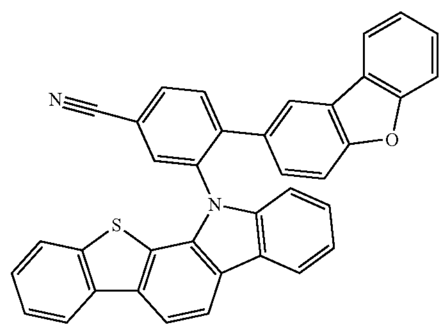
468
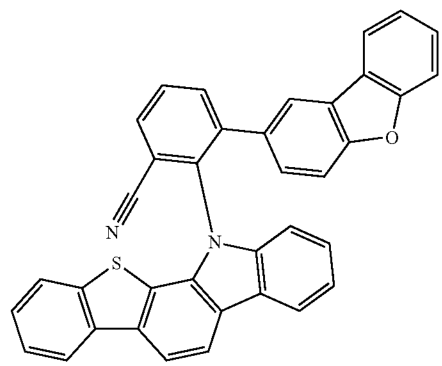
469
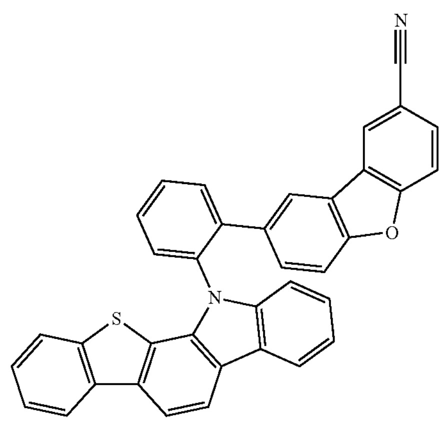

470
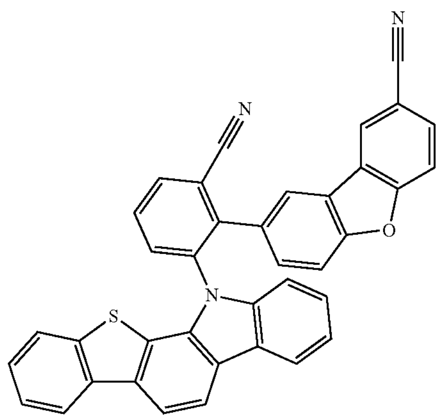
471
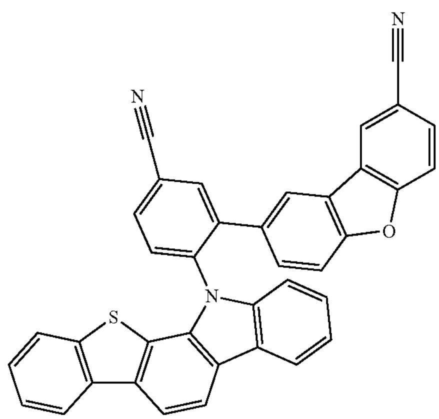
472
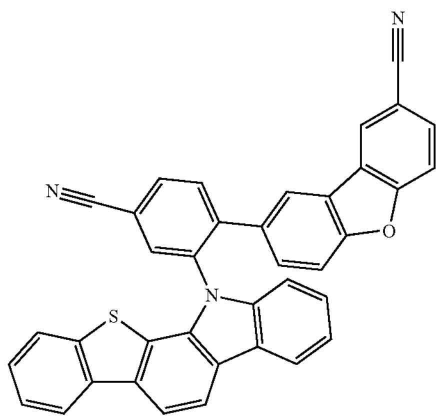
473
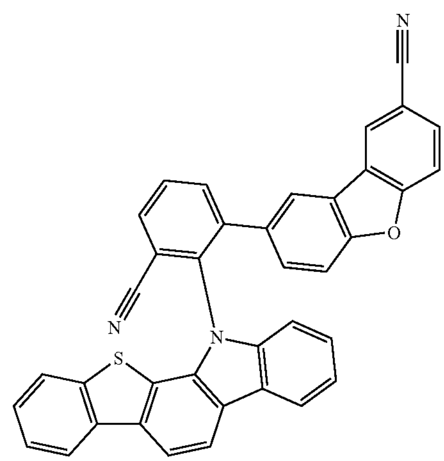
474
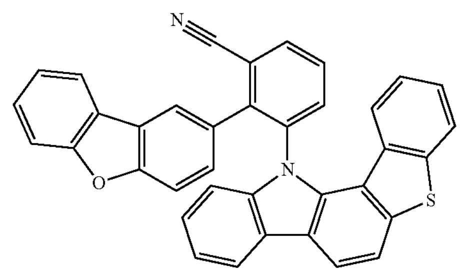
475
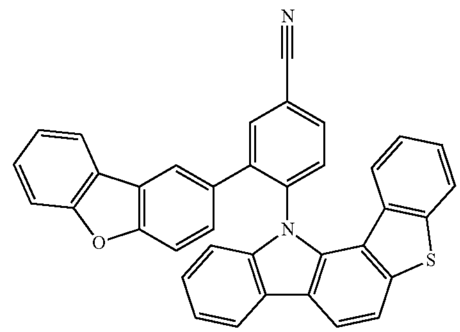
476
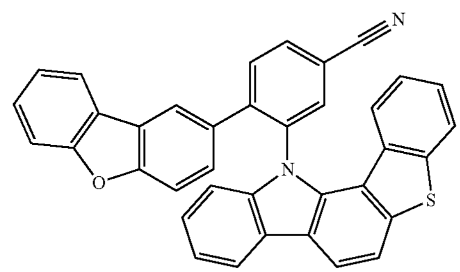

-continued
477
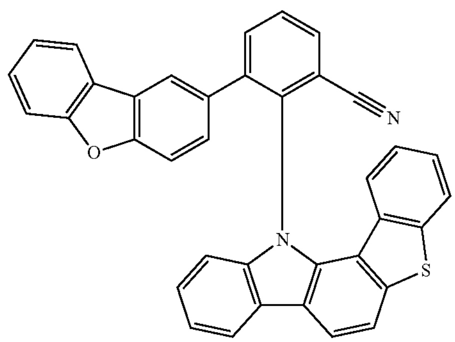
478
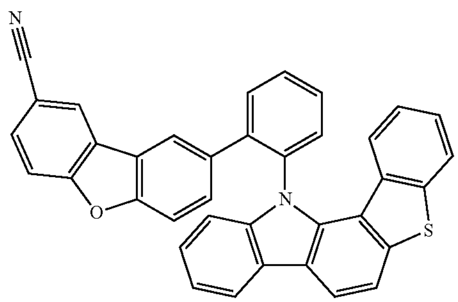
479
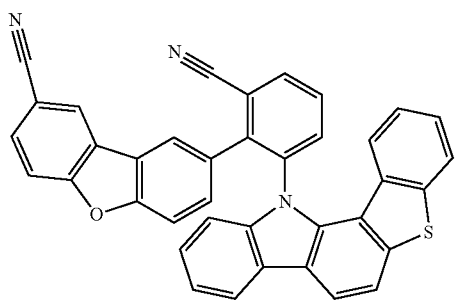
480
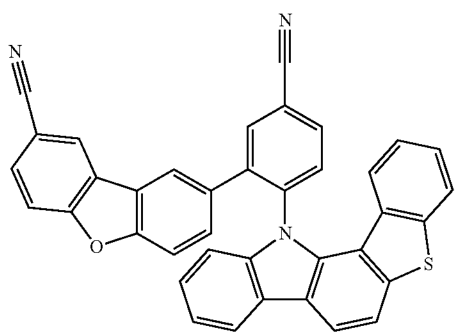
481
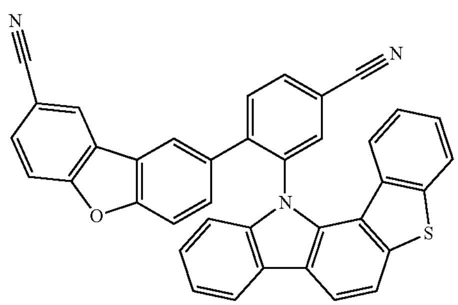
-continued
482
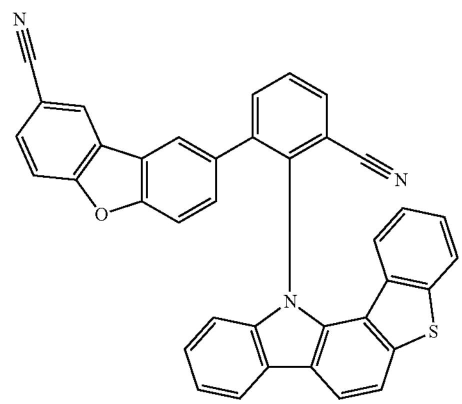
Group HE4
1
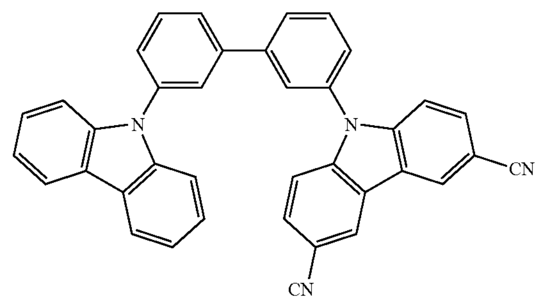
2
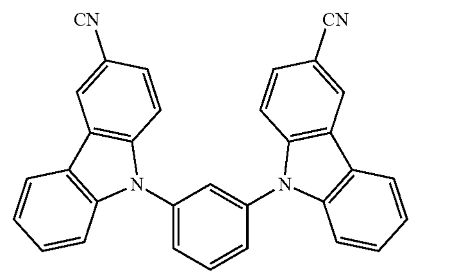
3
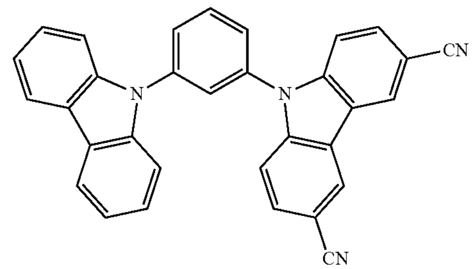
4
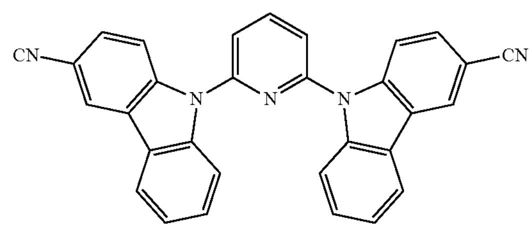

-continued
5
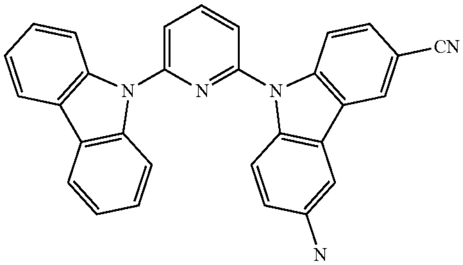
6
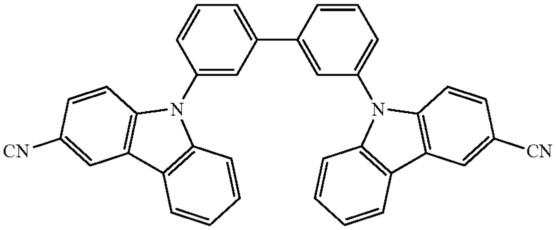
7
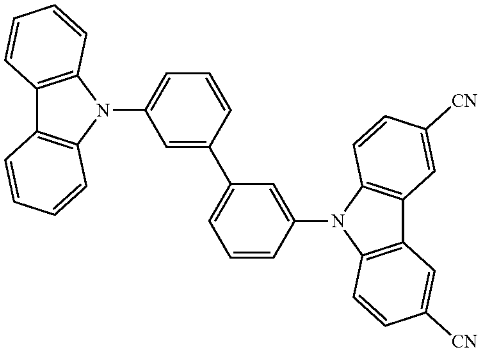
8
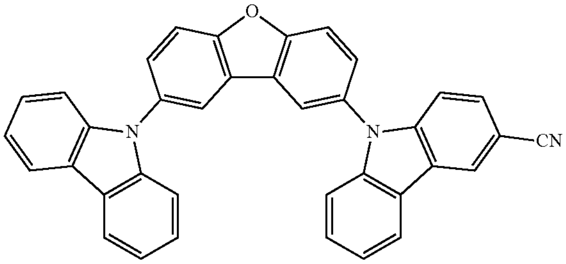
9
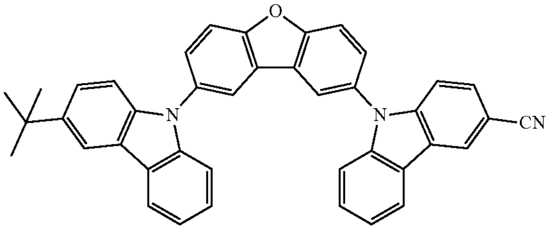
-continued
10
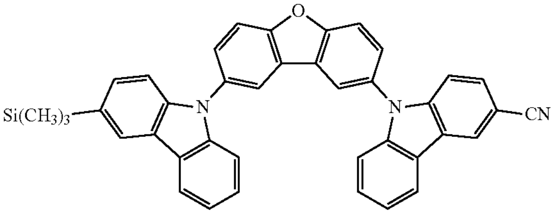
11
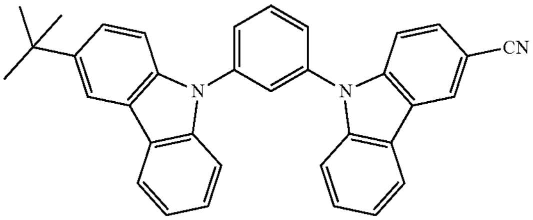
12
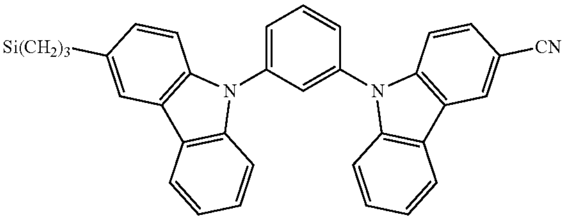
13
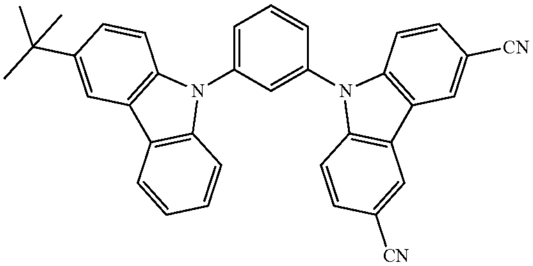
14
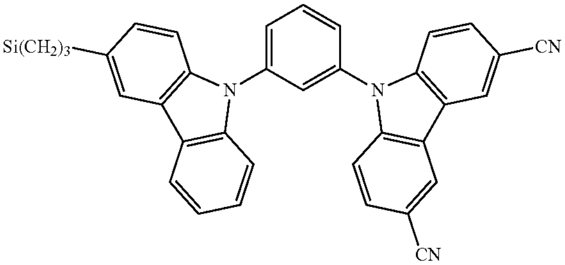
15
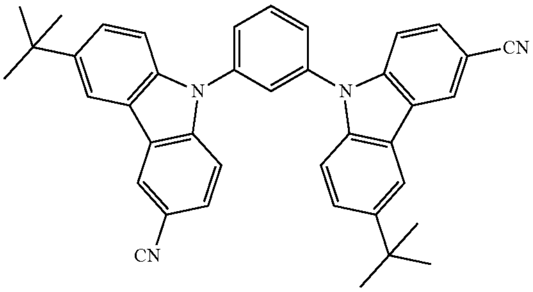

-continued
16
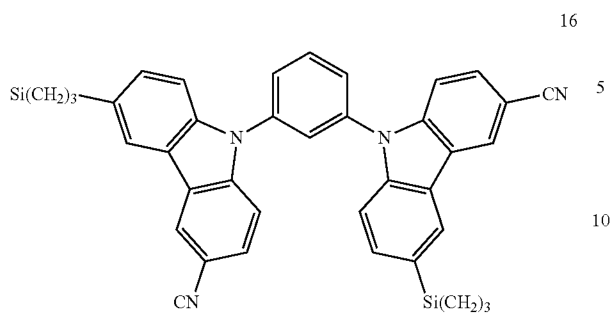
17
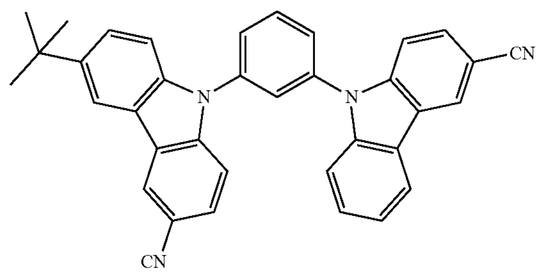
18
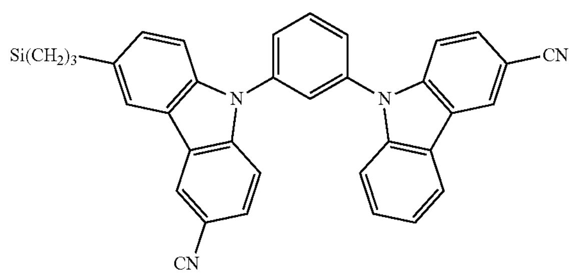
19
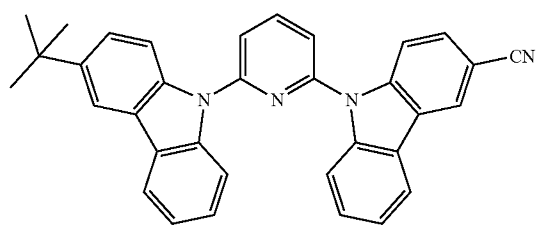
20
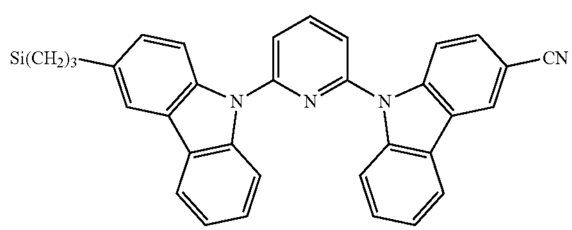
-continued
21
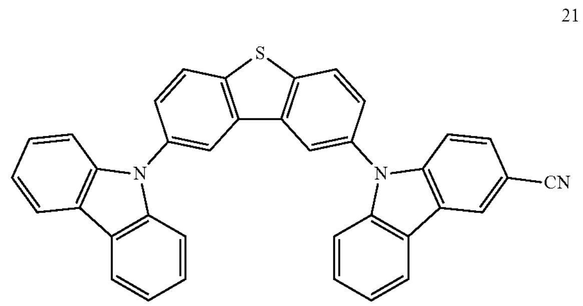
22
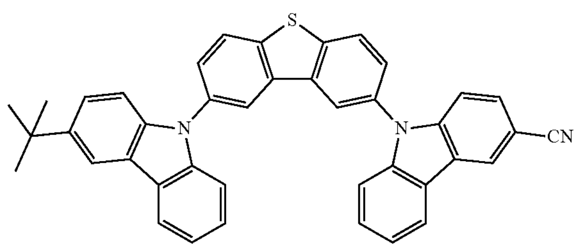
23
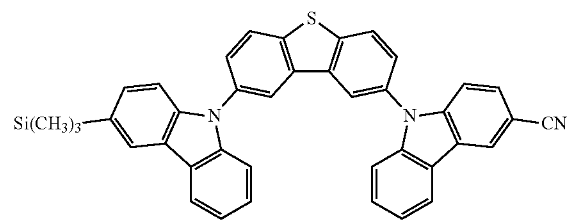
24
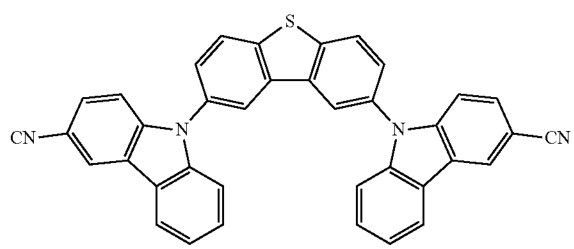
25
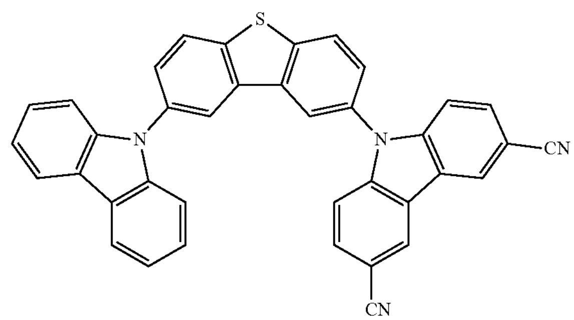

-continued
26
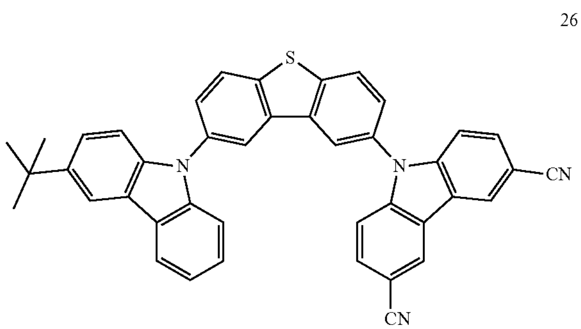
27
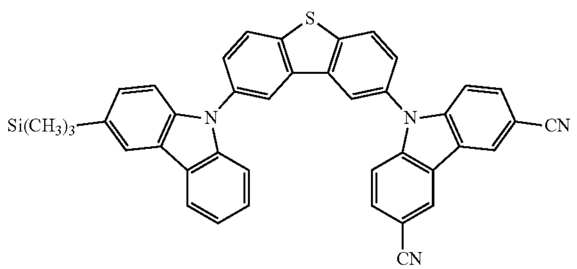
28
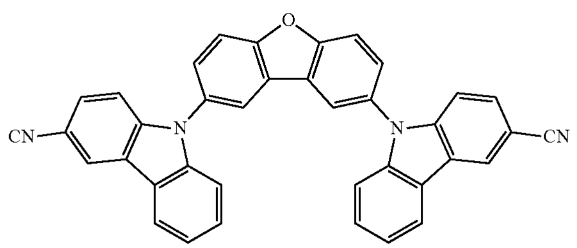
29
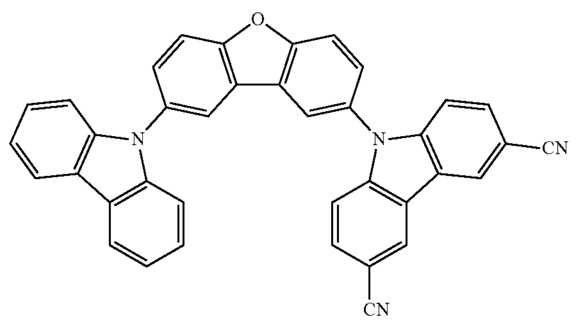
30
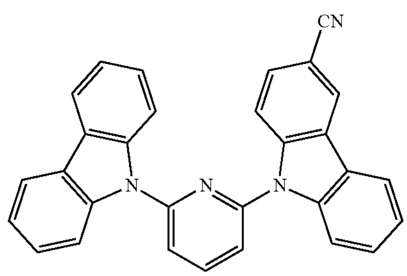
-continued
31
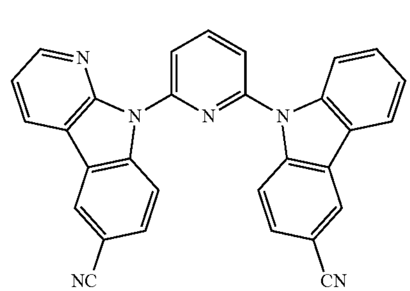
32
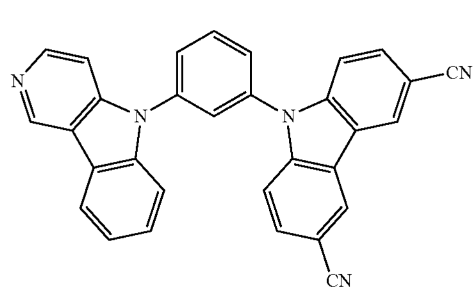
33
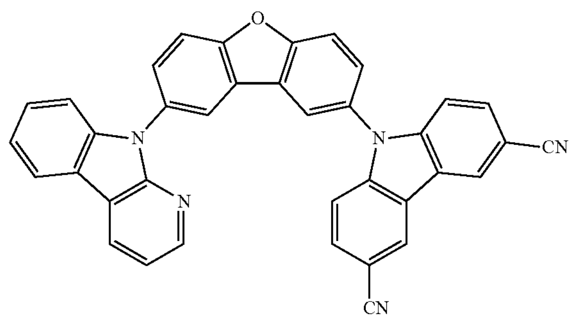
34
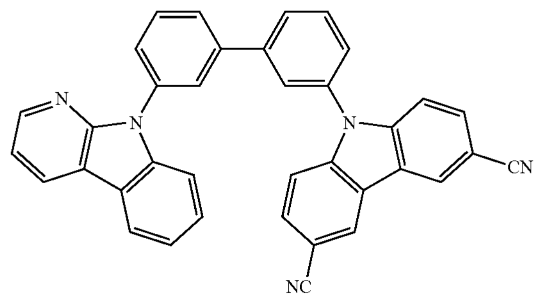
35
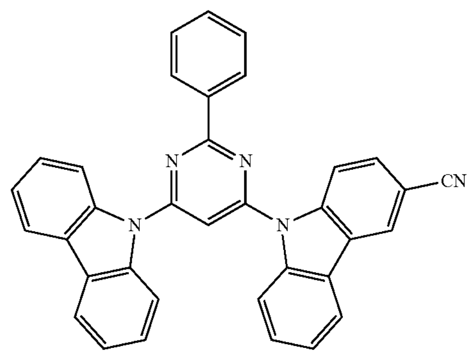

-continued
36
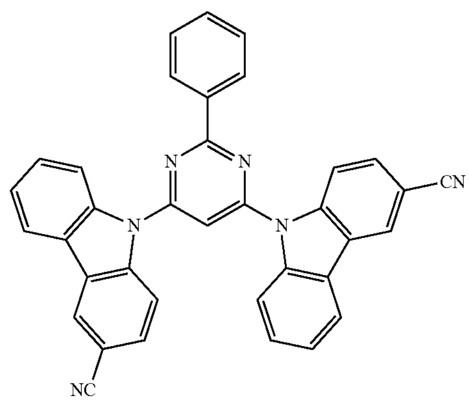
37
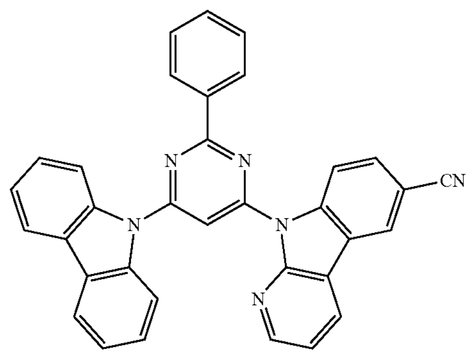
38
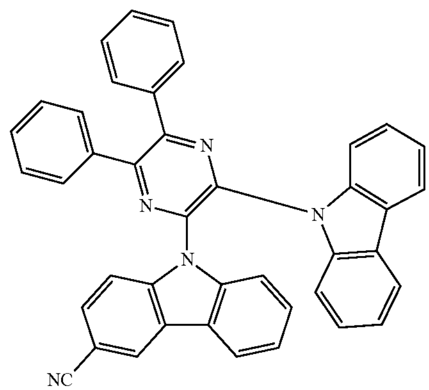
39
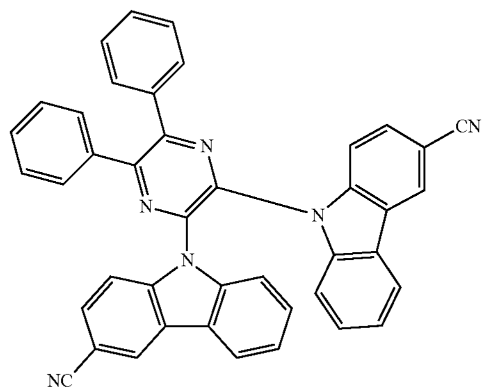
-continued
40
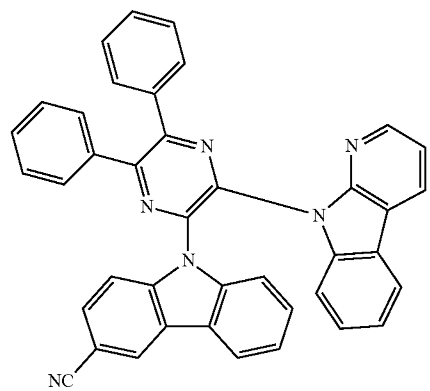
41
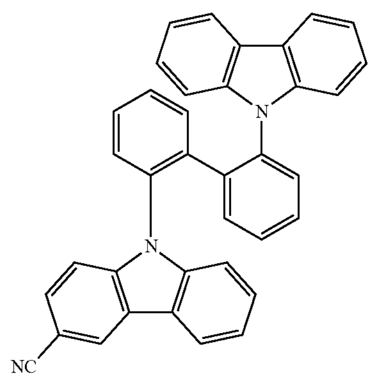
42
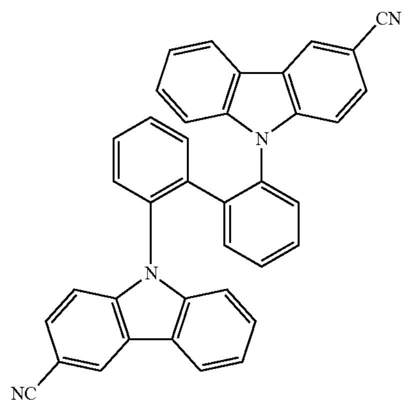
43
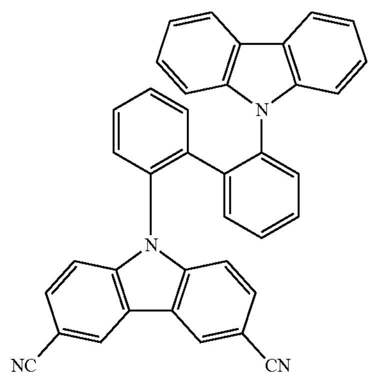

44
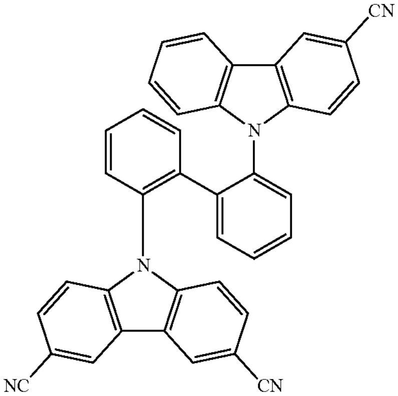
45
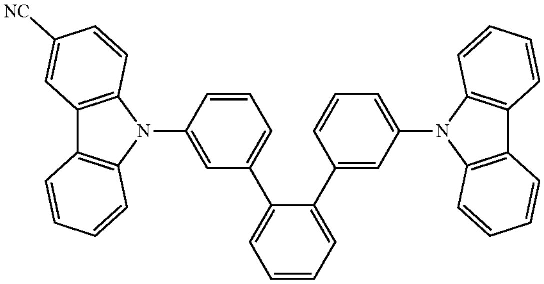
46
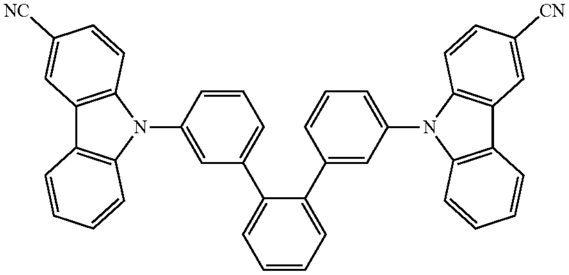
47
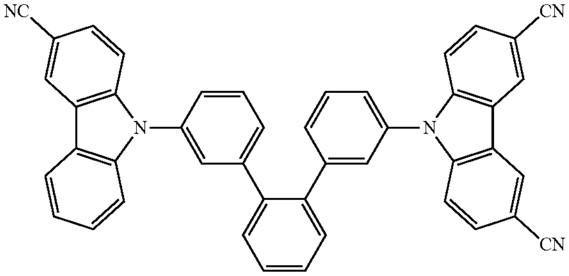
48
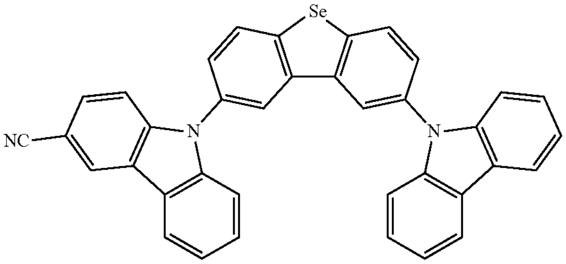
49
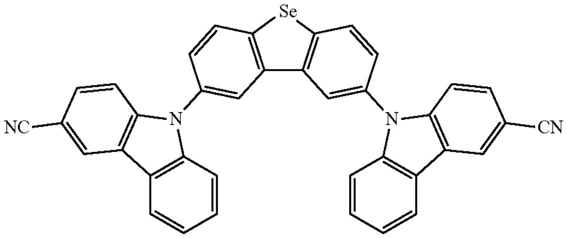
50
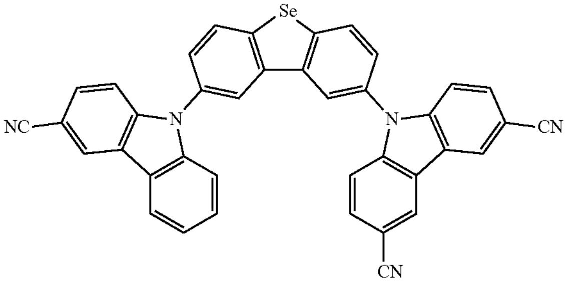
51
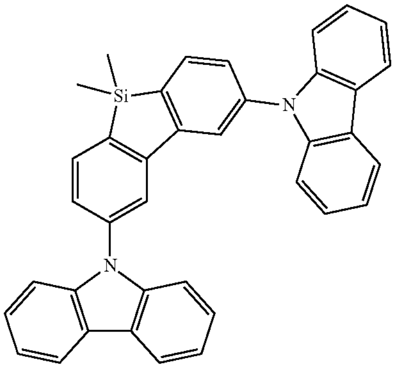
52
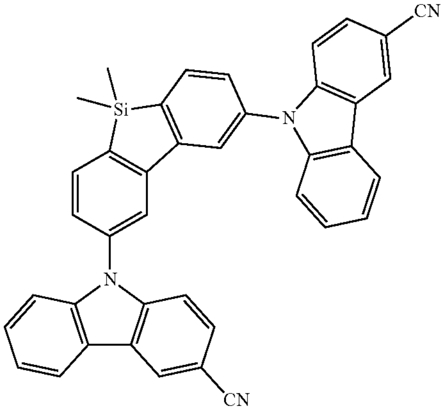

-continued
53
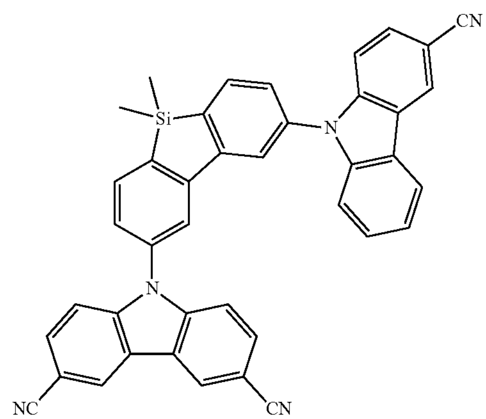
54
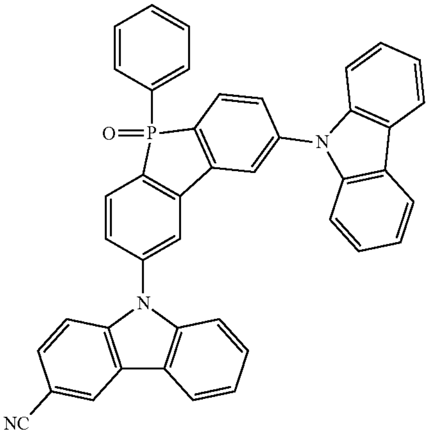
55
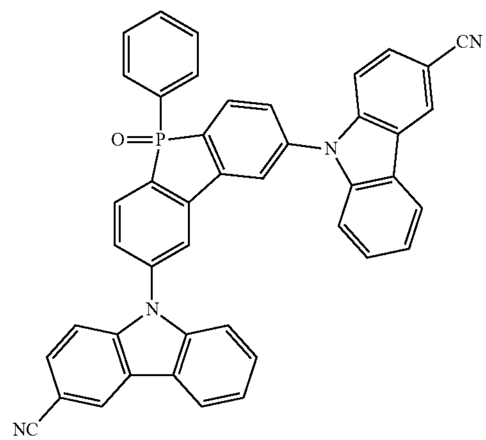
-continued
56
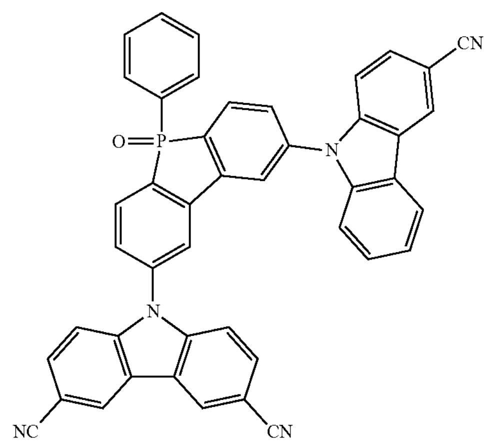
Group HE5
1
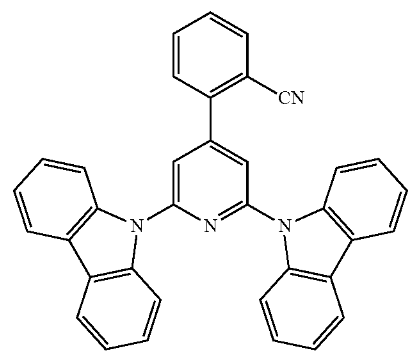
2
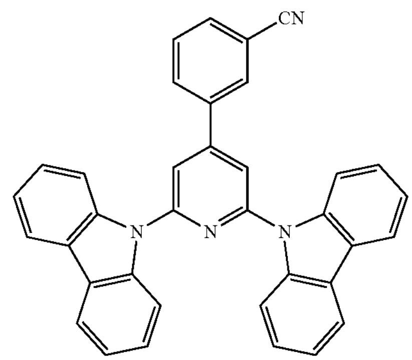

-continued
3
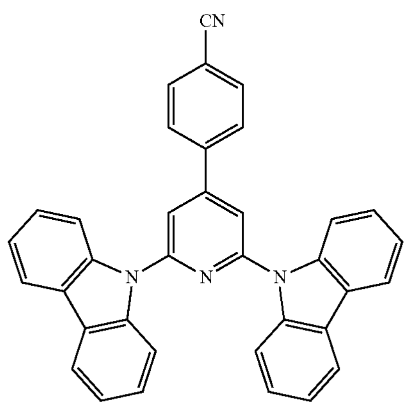
4
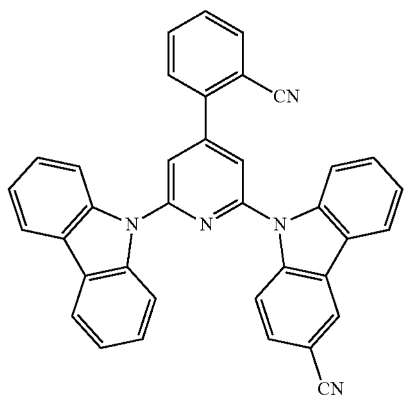
5
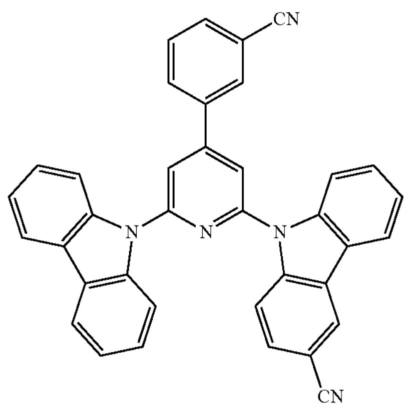
6
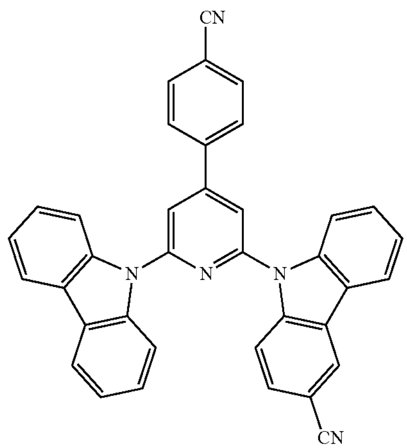
-continued
7
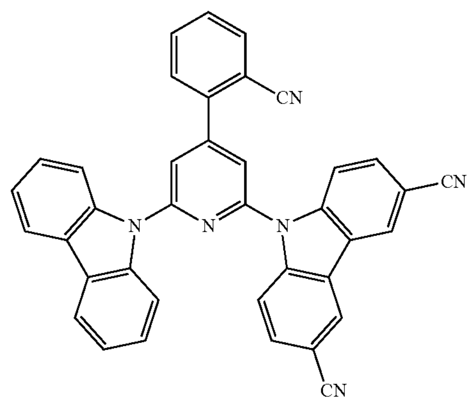
8
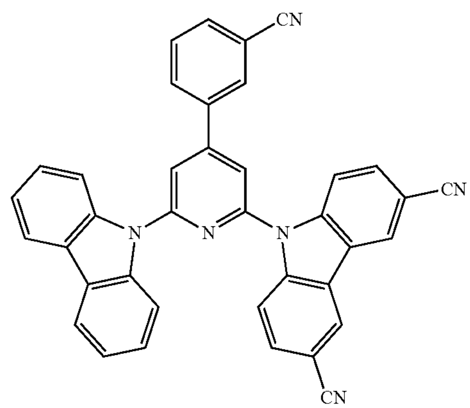
9
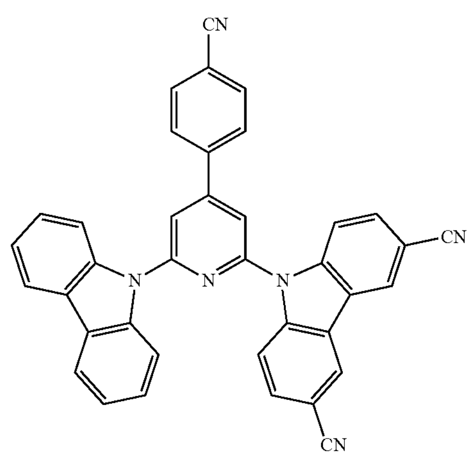
10
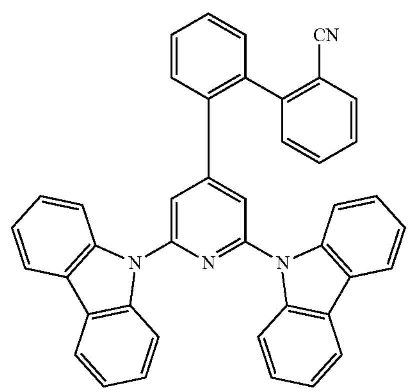

-continued
11
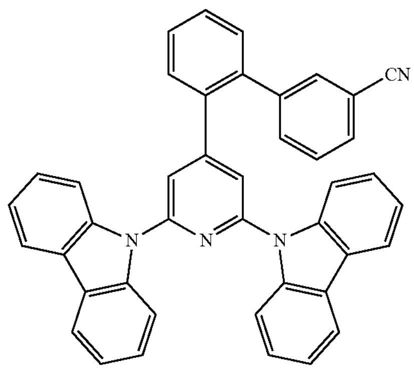
12
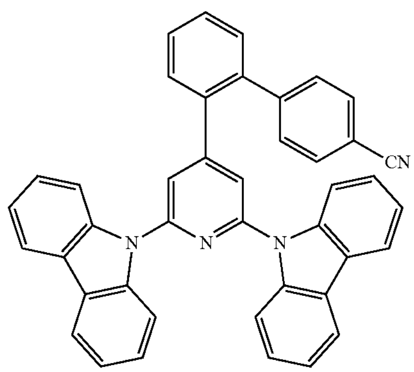
13
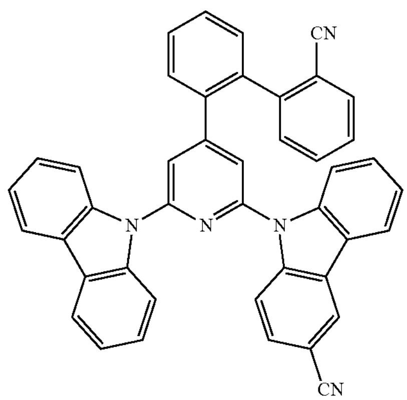
14
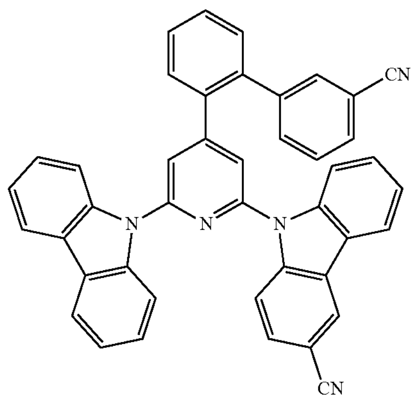
-continued
15
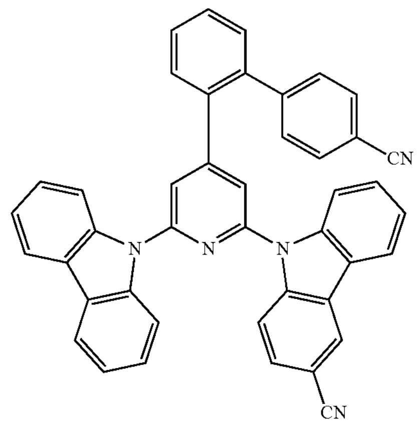
16
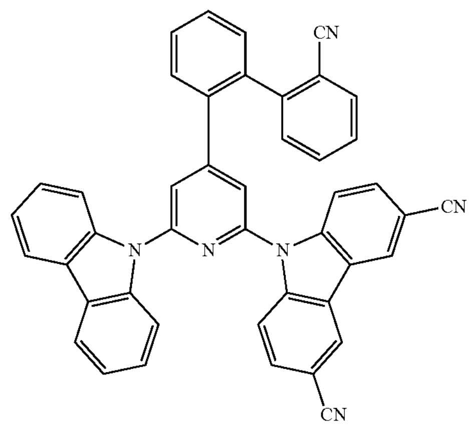
17
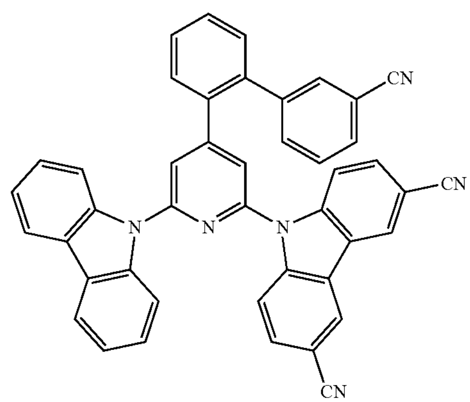

-continued
18
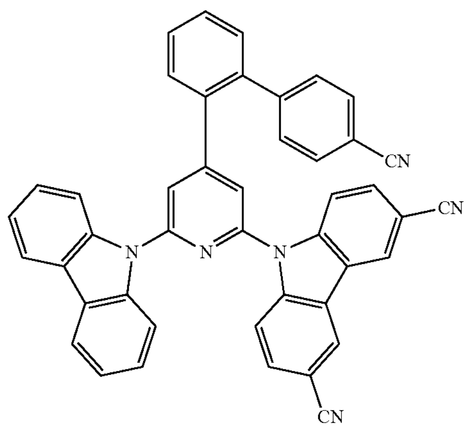
19
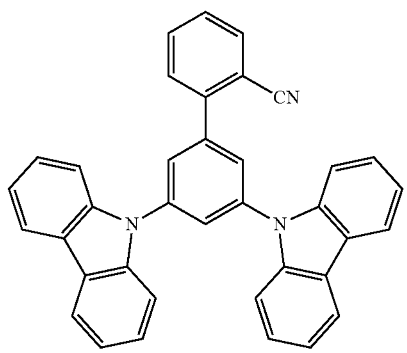
20
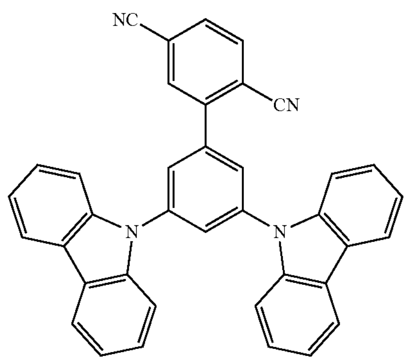
21
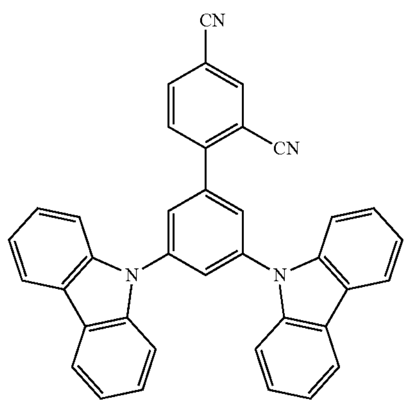
-continued
22
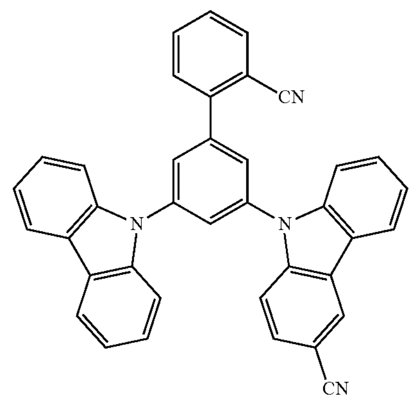
23
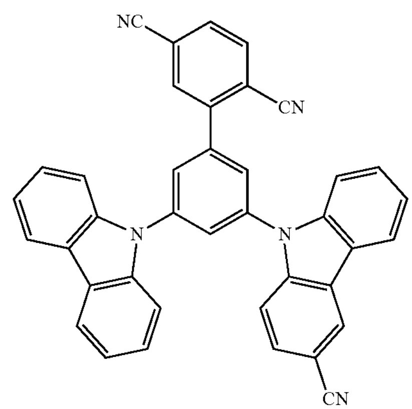
24
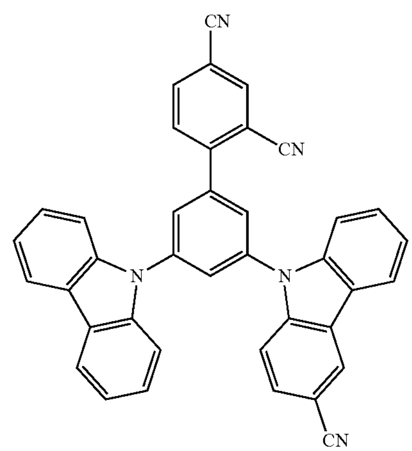
25
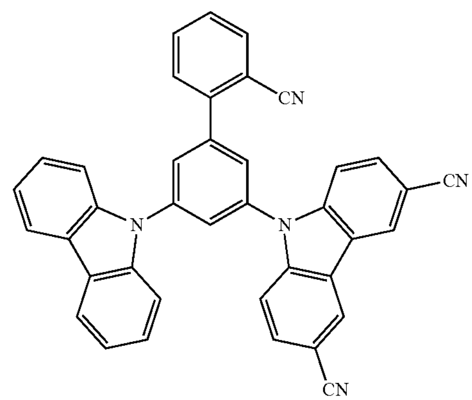

26
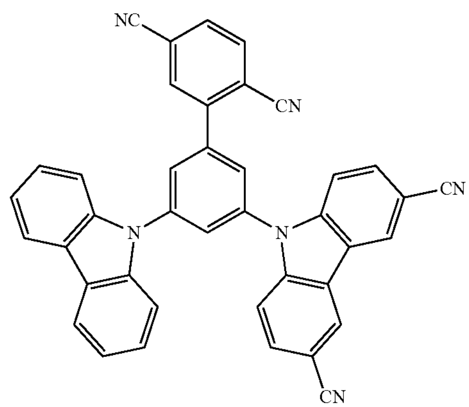
27
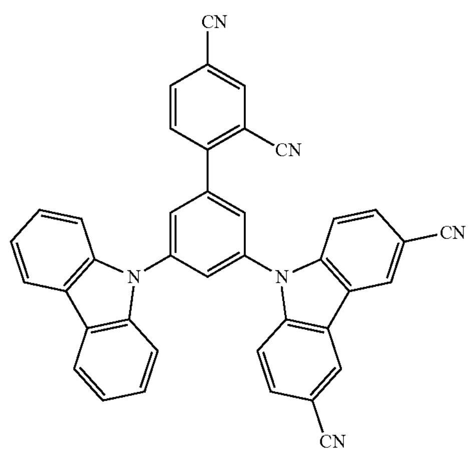
28
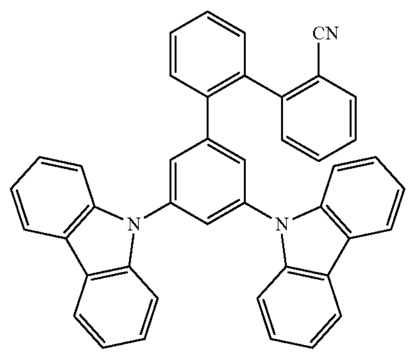
29
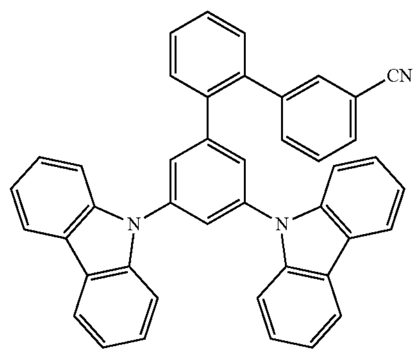
30
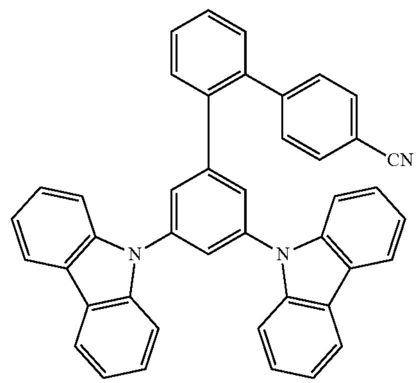
31
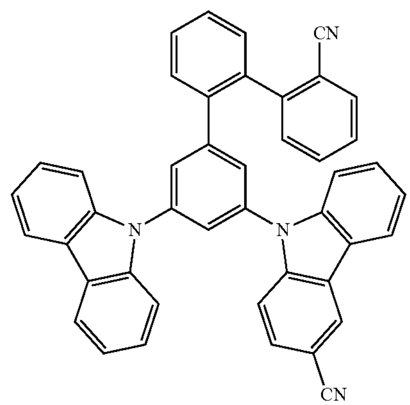
32
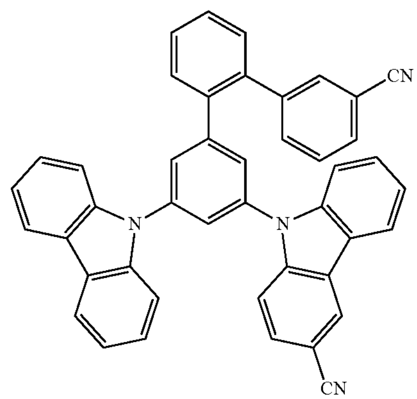
33
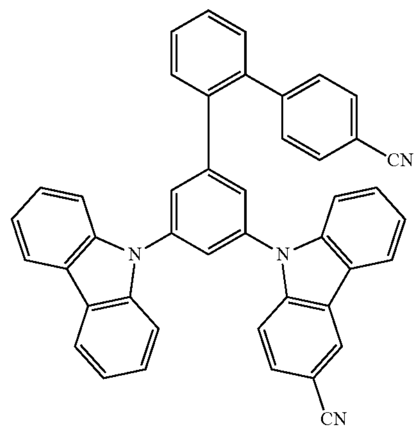

-continued
34
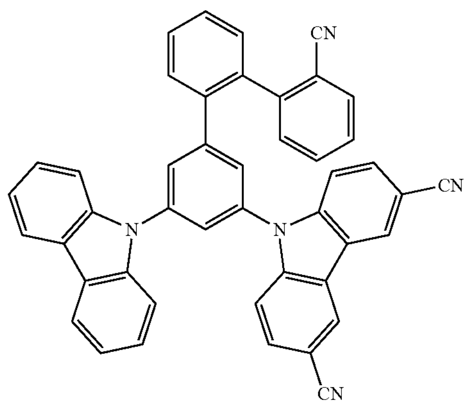
35
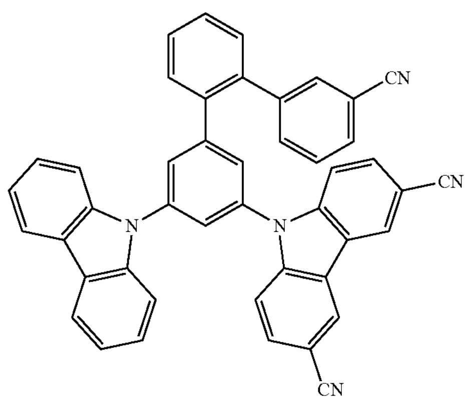
36
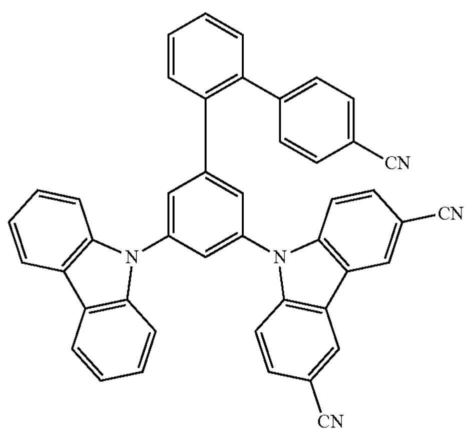
37
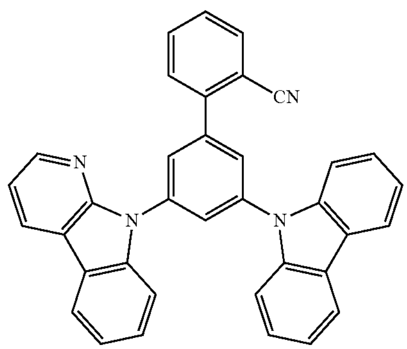
-continued
38
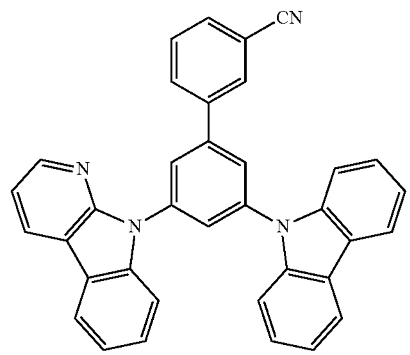
39
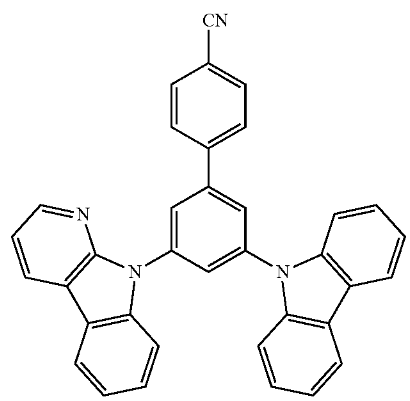
40
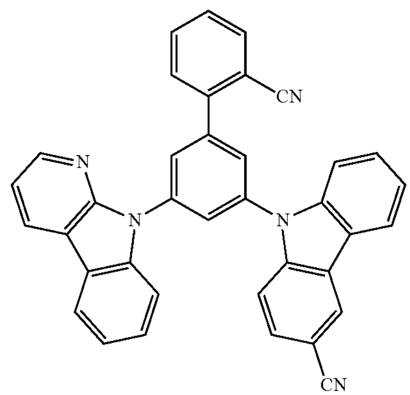
41
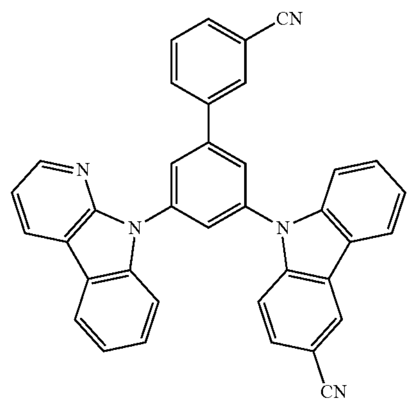

-continued
42
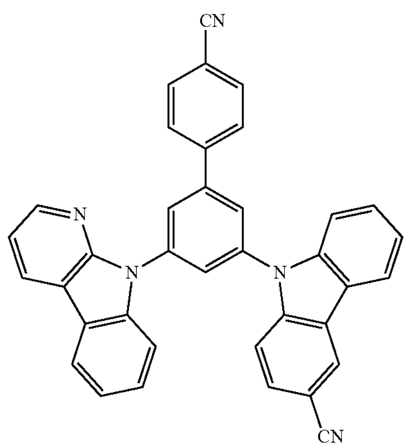
43
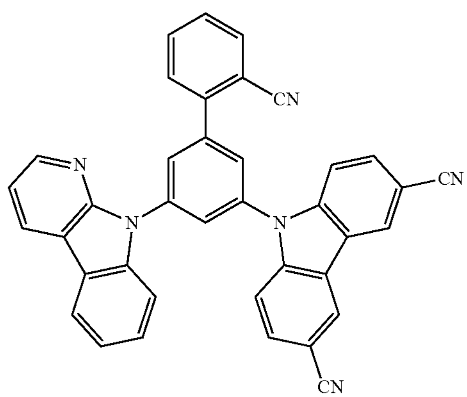
44
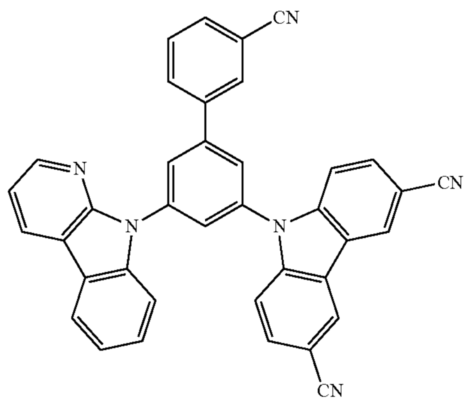
-continued
45
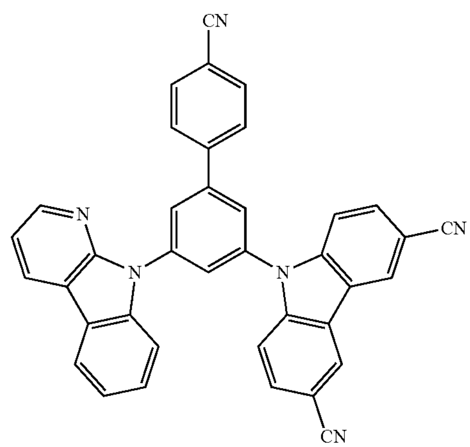
46
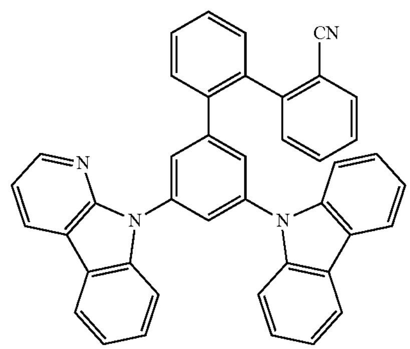
47
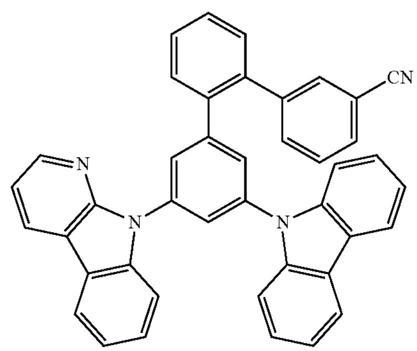
48
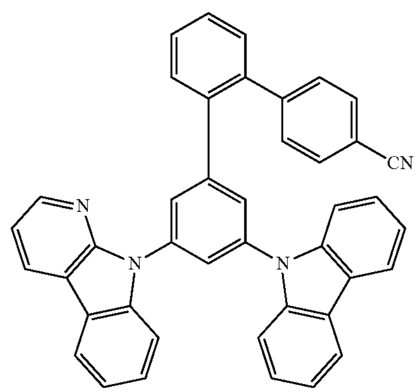

-continued
49
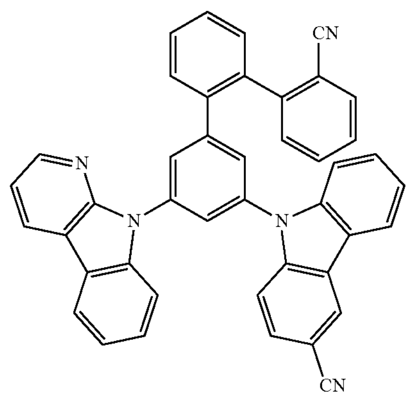
50
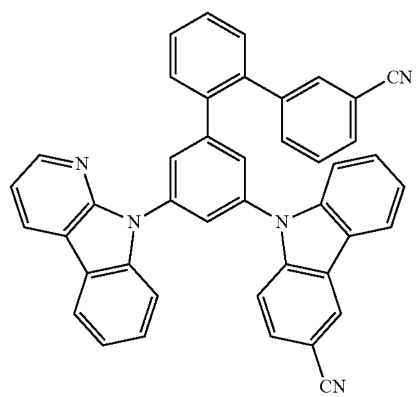
51
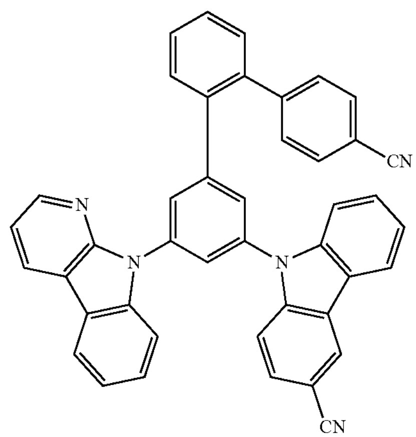
52
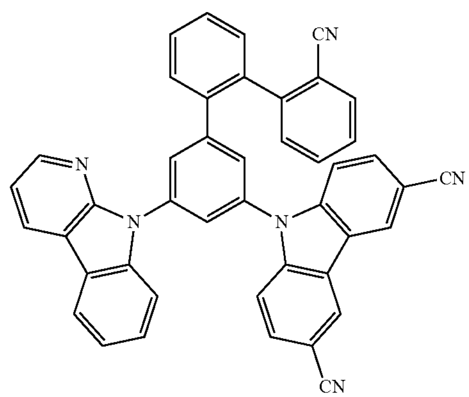
-continued
53
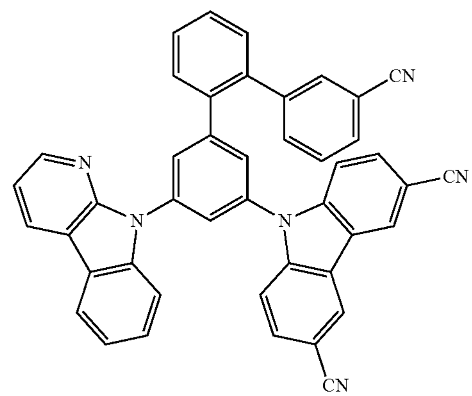
54
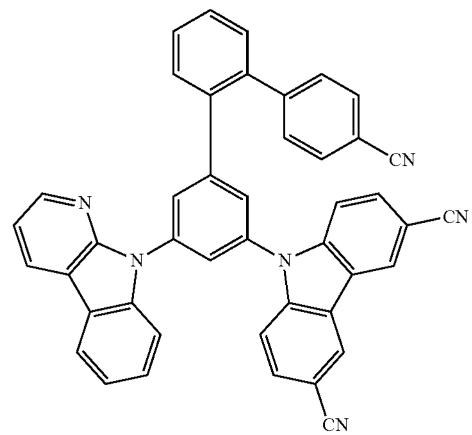
55
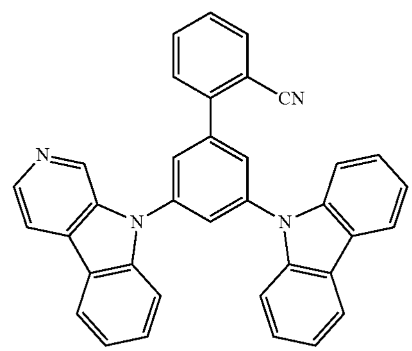
56
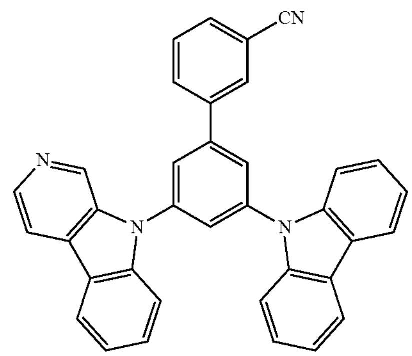

-continued
57
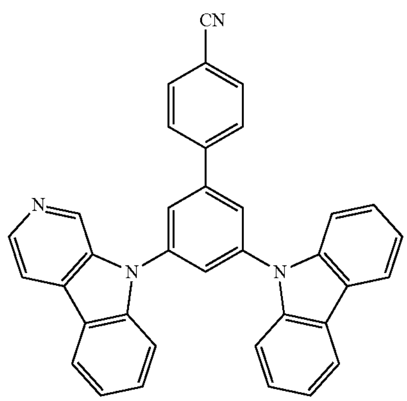
58
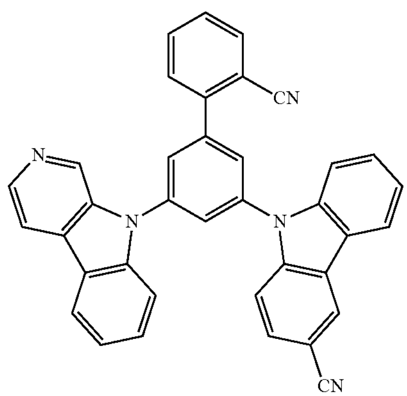
59
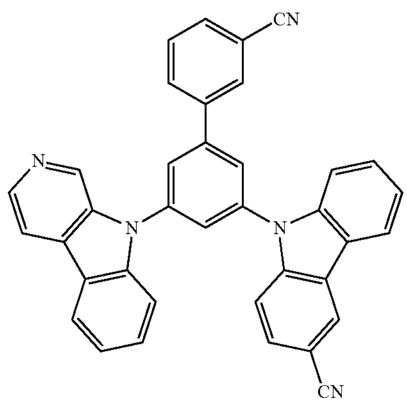
60
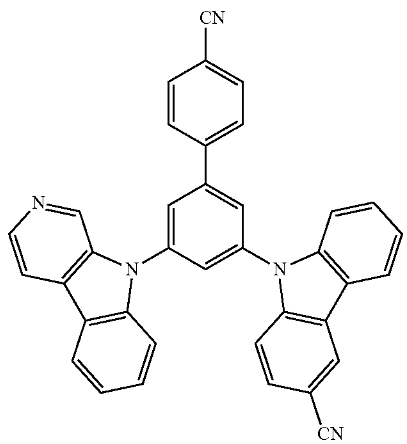
-continued
61
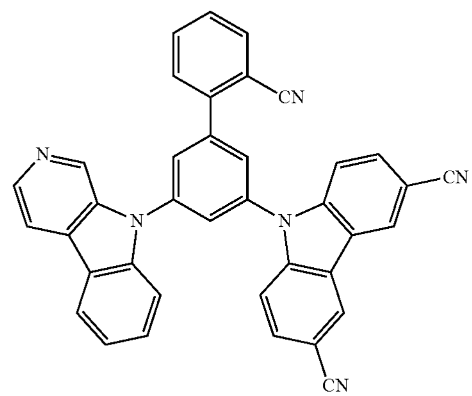
62
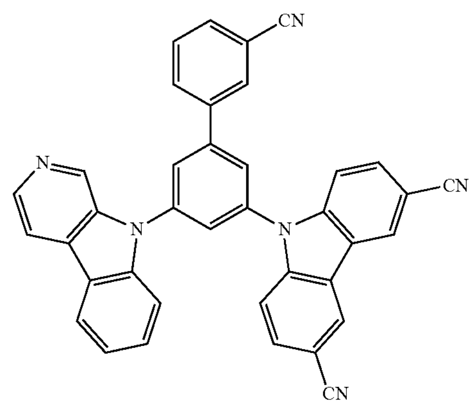
63
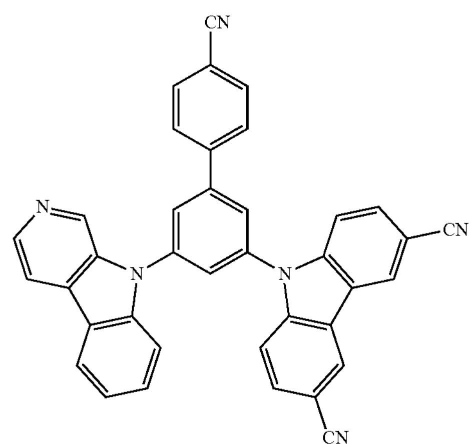
64
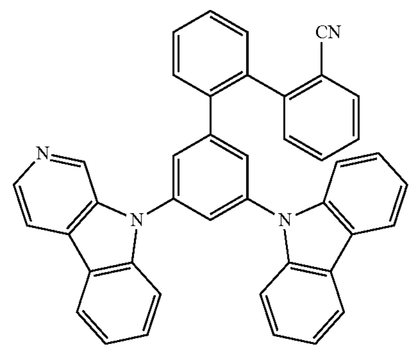

-continued
65
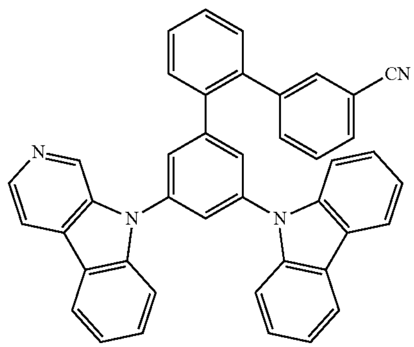
66
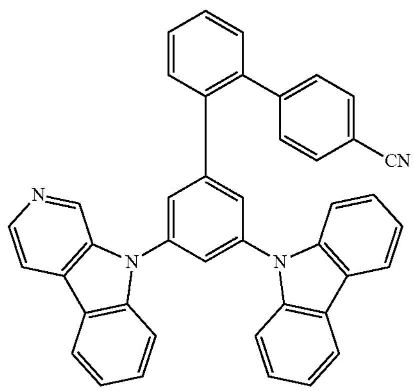
67
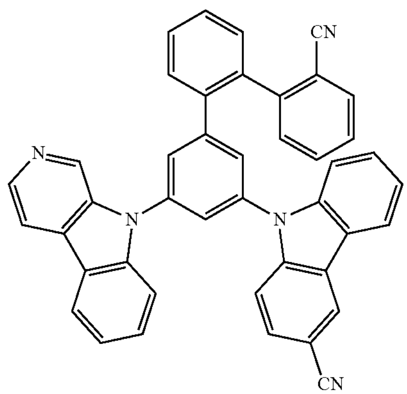
68
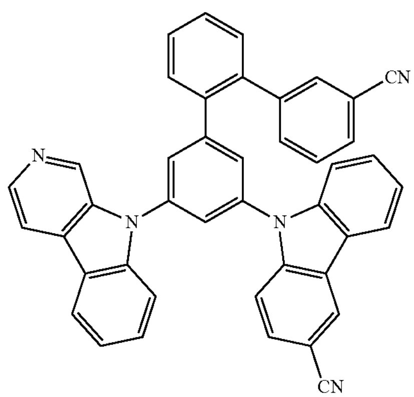
-continued
69
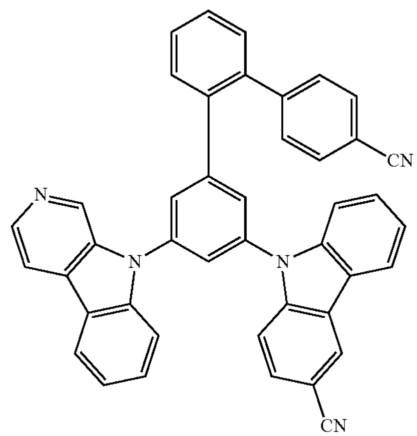
70
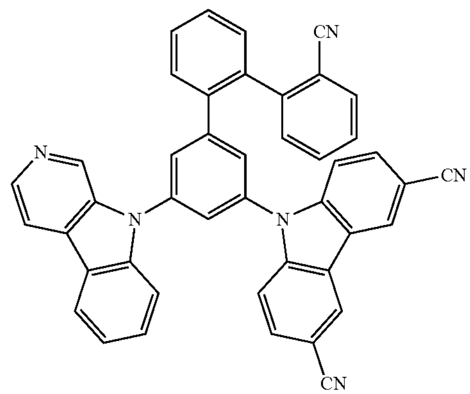
71
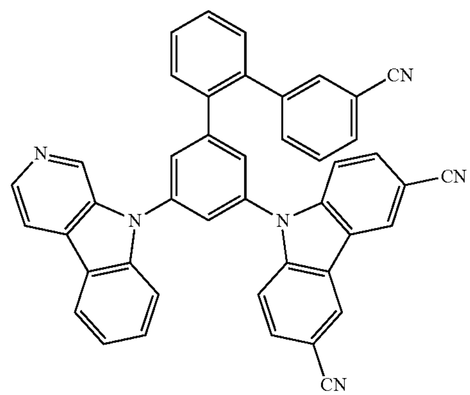
72
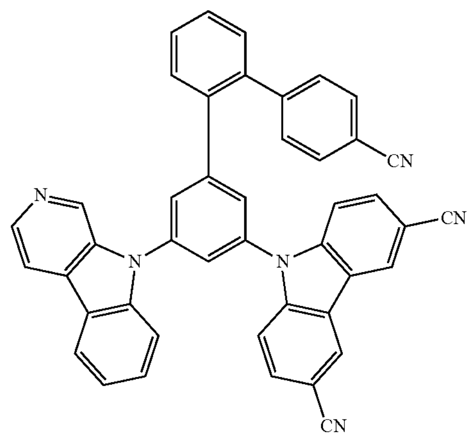

-continued
73
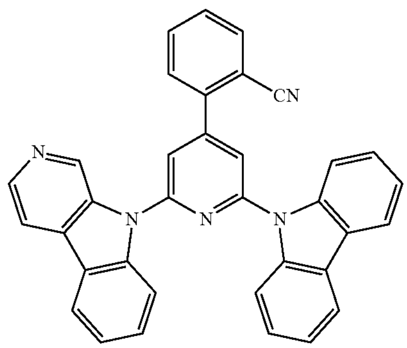
74
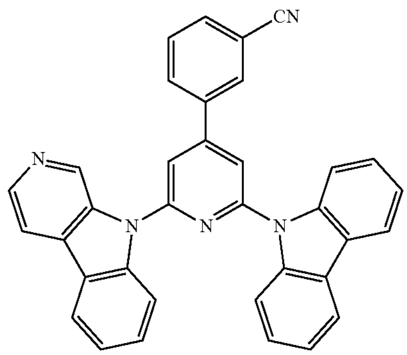
75
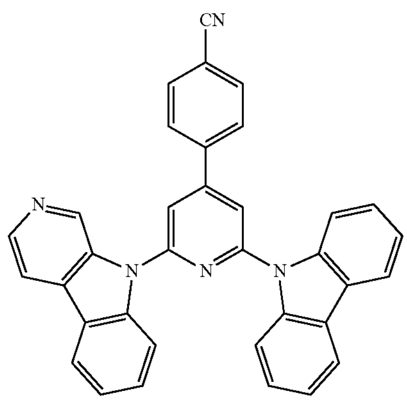
76
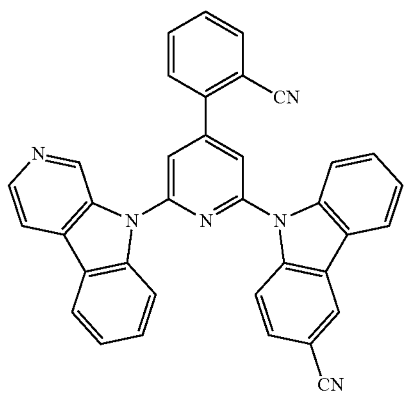
-continued
77
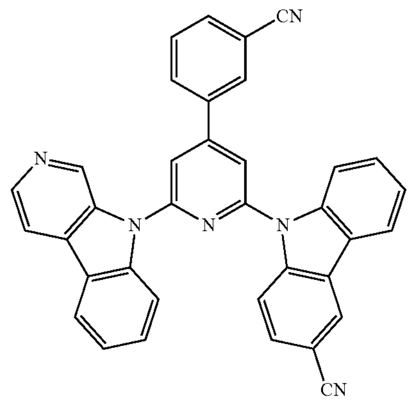
78
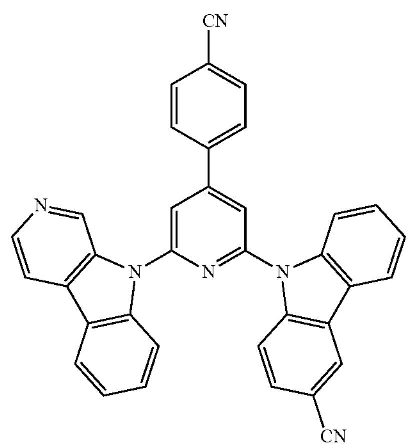
79
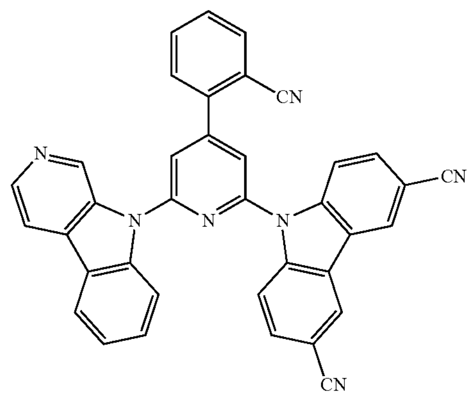
80
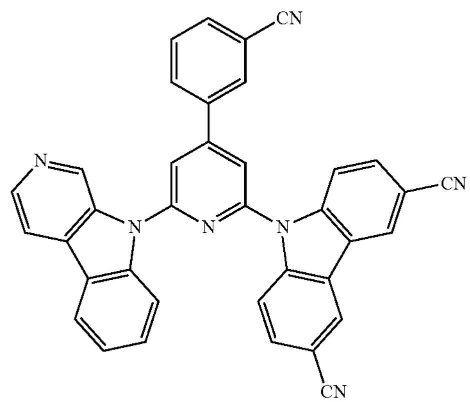

-continued
81
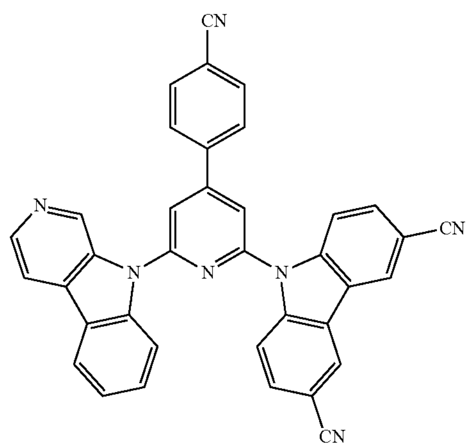
82
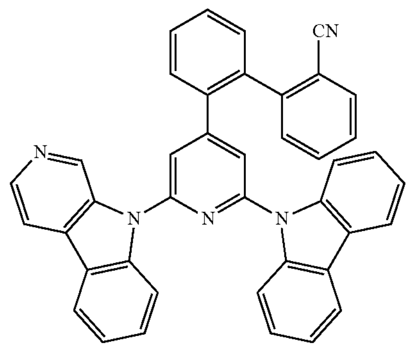
83
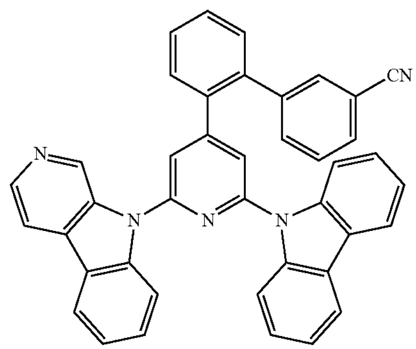
84
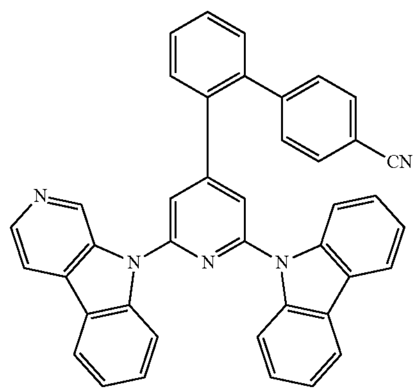
-continued
85
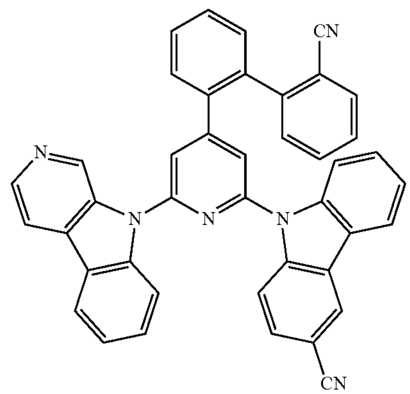
86
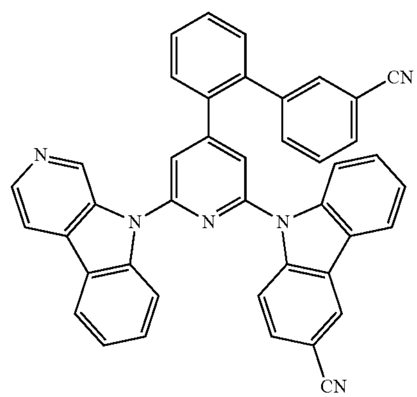
87
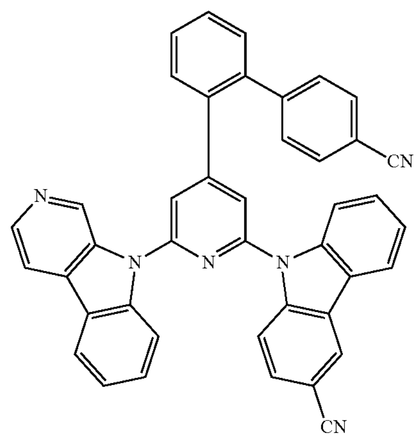
88
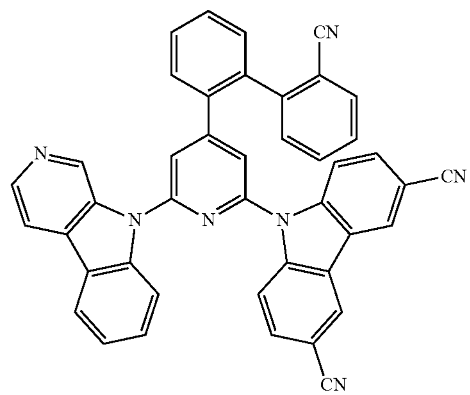

-continued
89
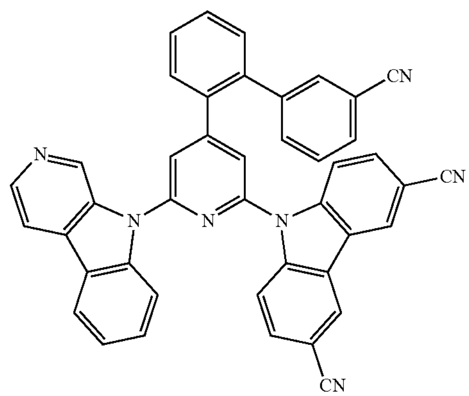
90
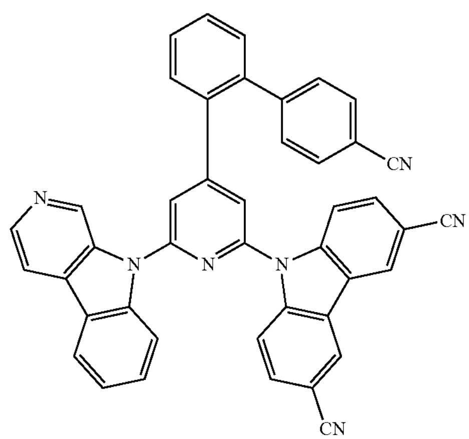
91
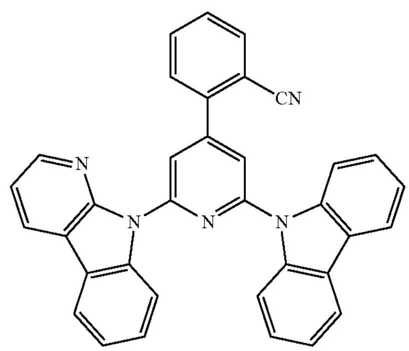
92
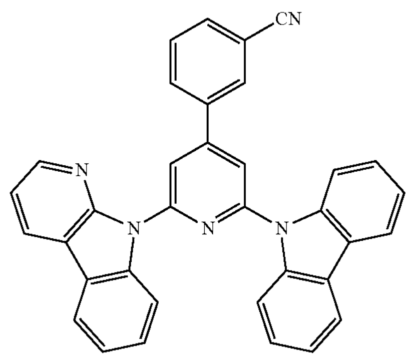
-continued
93
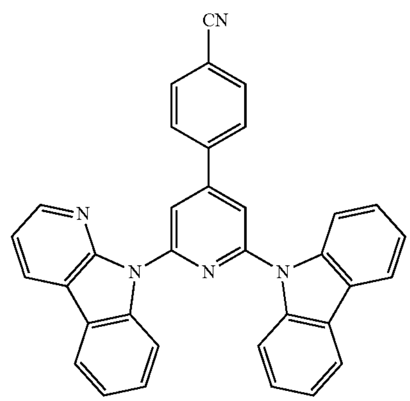
94
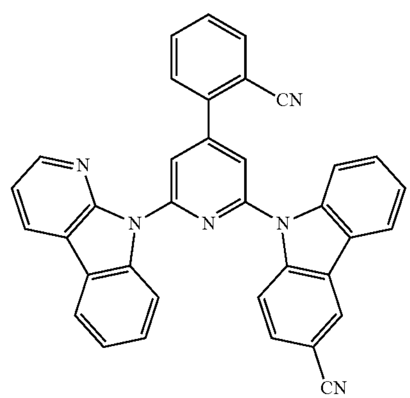
95
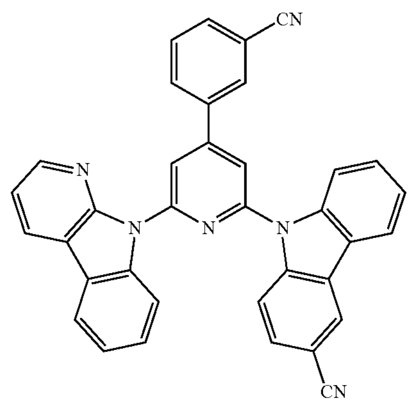
96
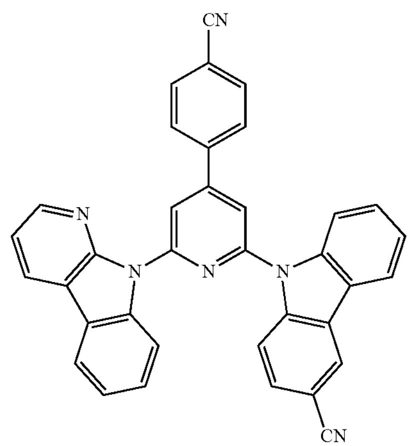

-continued
97
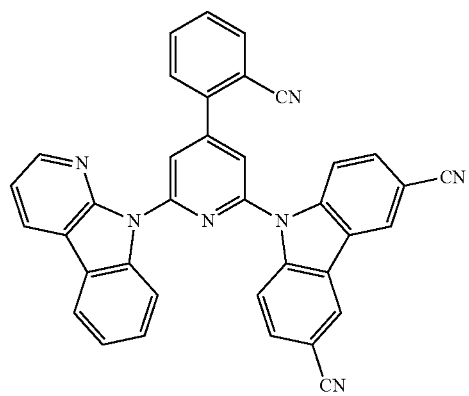
98
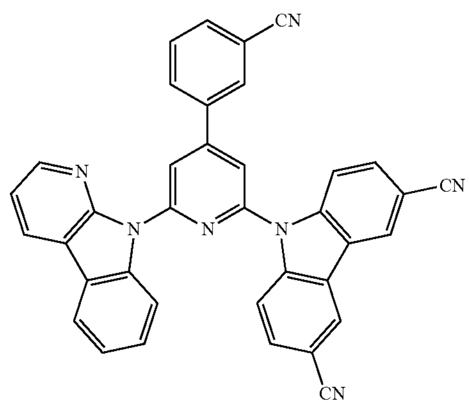
99
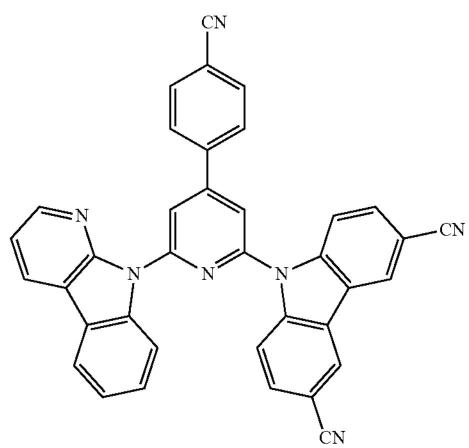
100
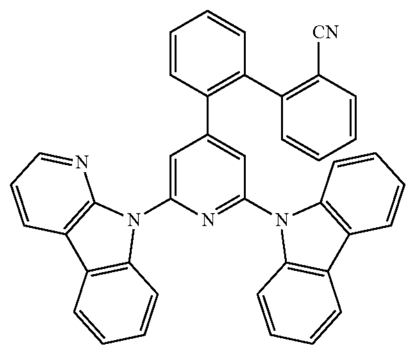
-continued
101
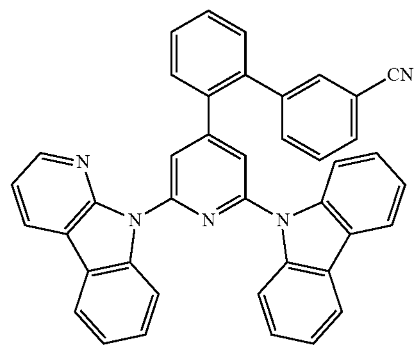
102
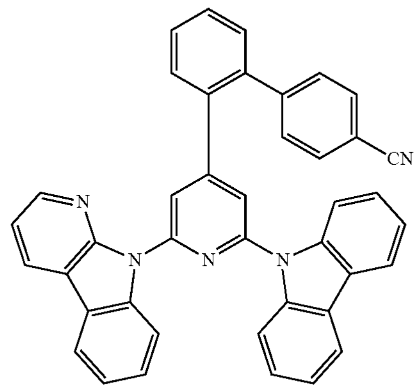
103
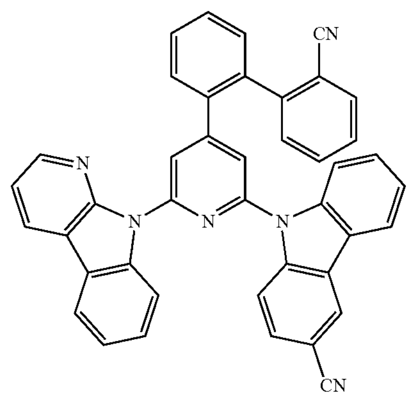
104
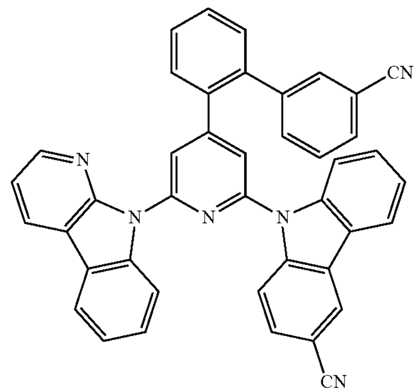

-continued
105
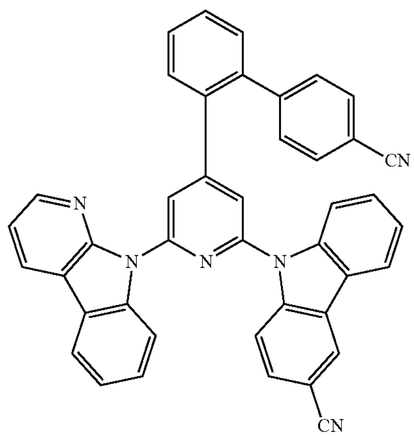
106
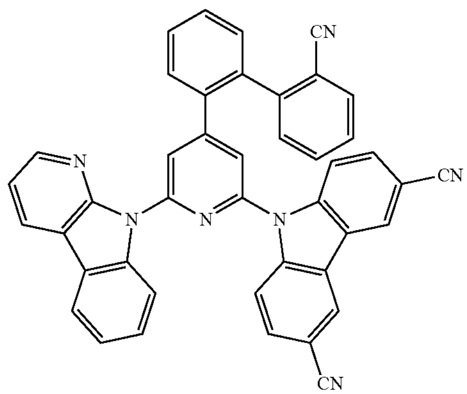
107
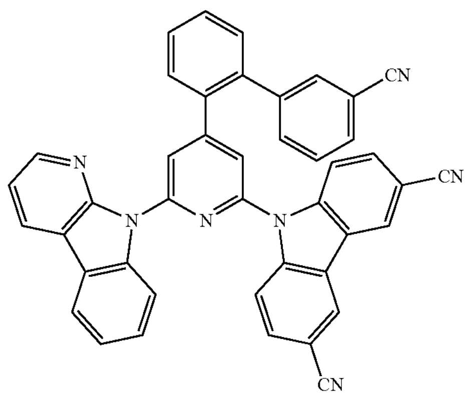
108
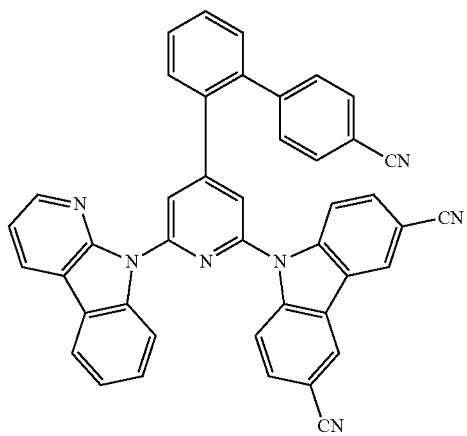
-continued
109
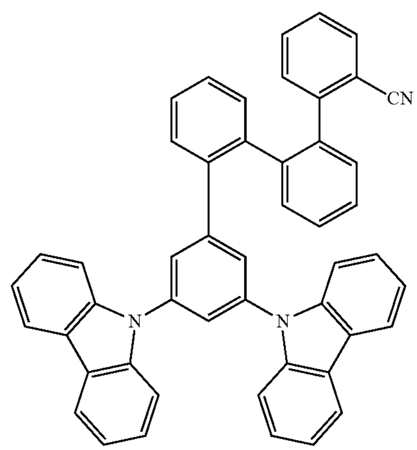
110
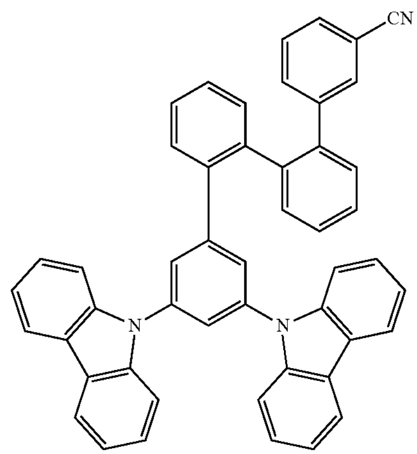
111
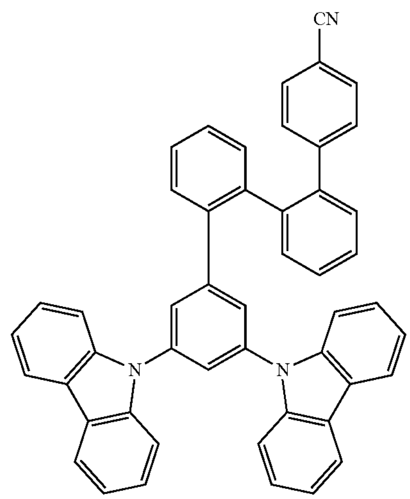

112
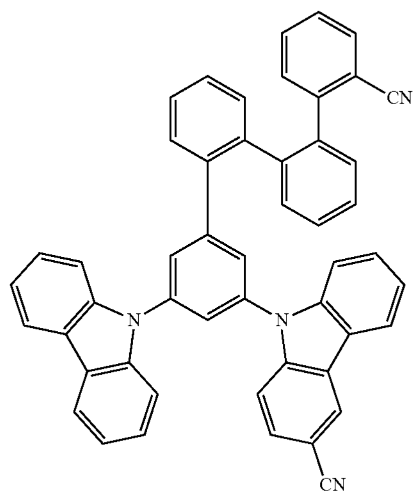
113
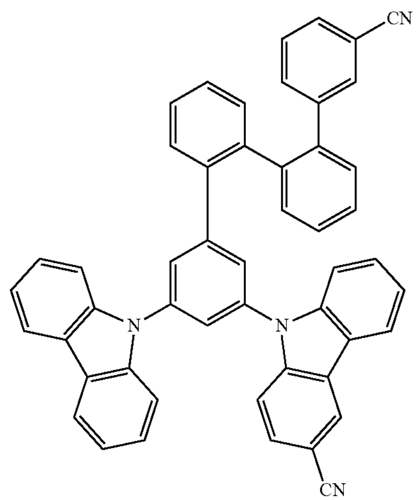
114
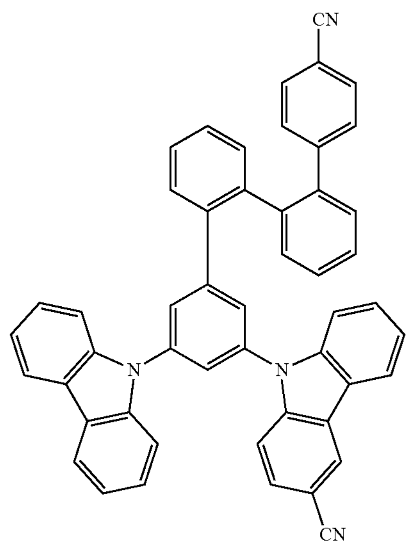
115
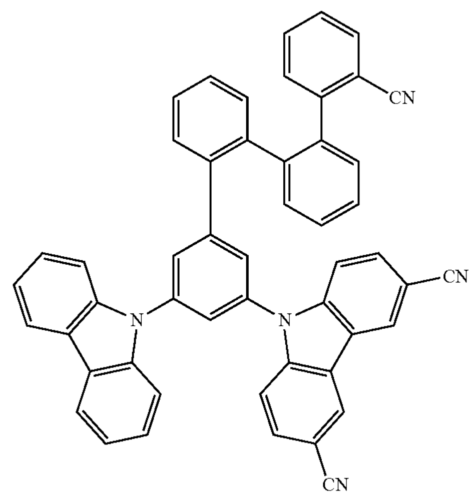
116
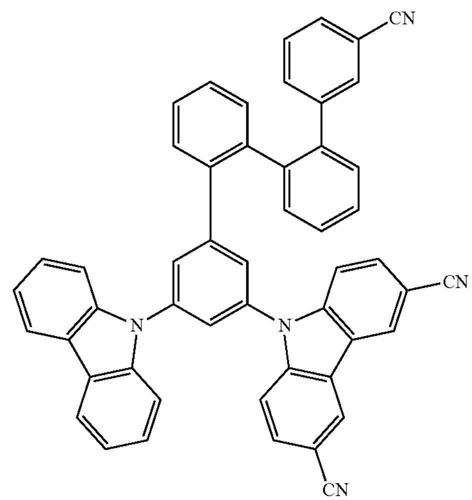
117
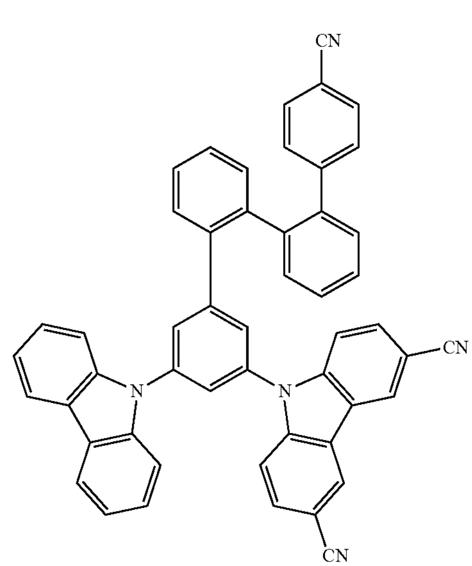

118
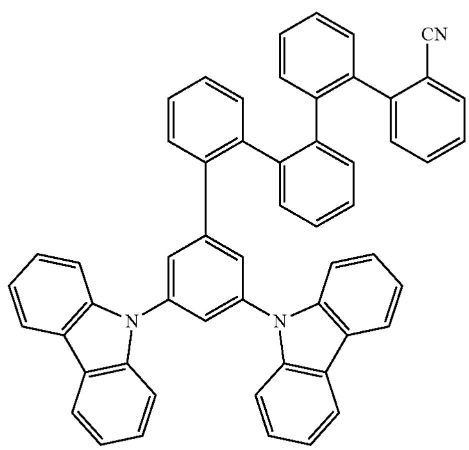
119
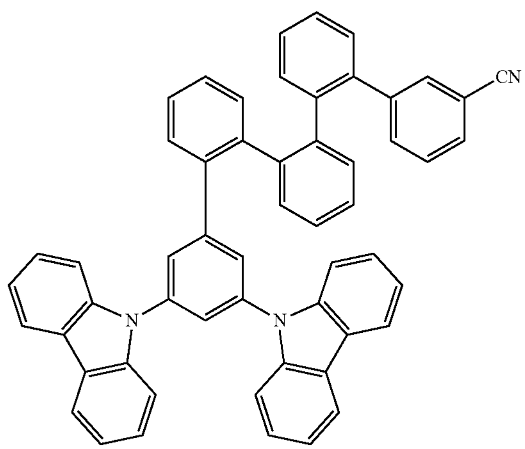
120
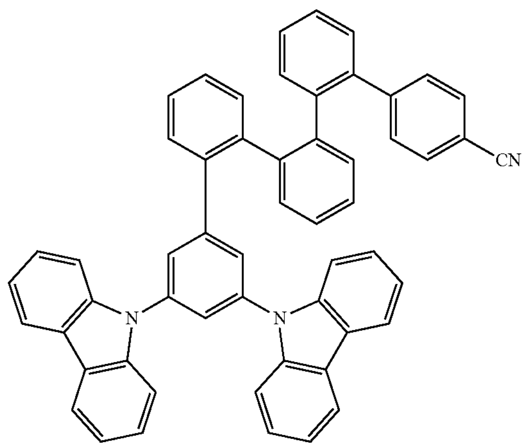
121
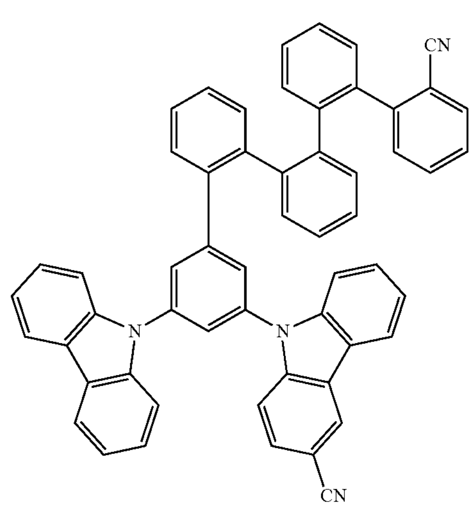
122
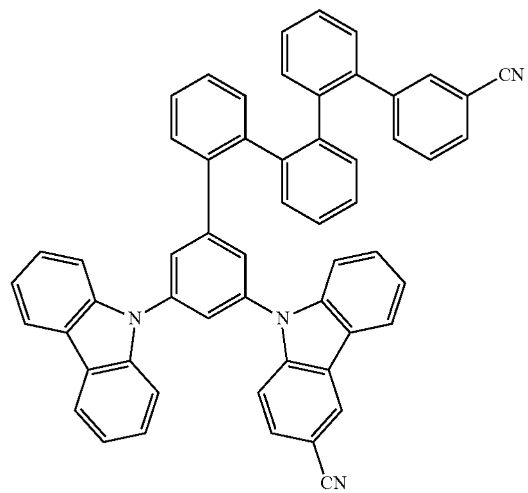
123
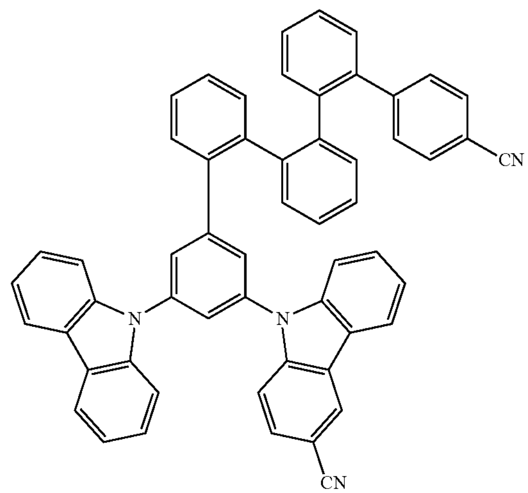

-continued
124
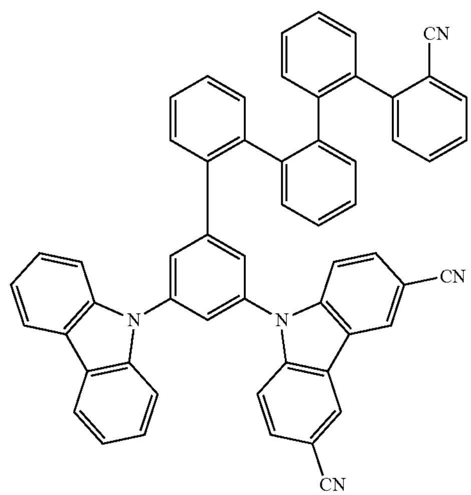
125
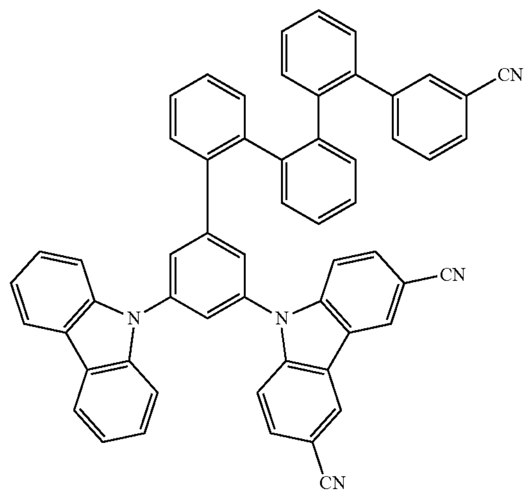
126
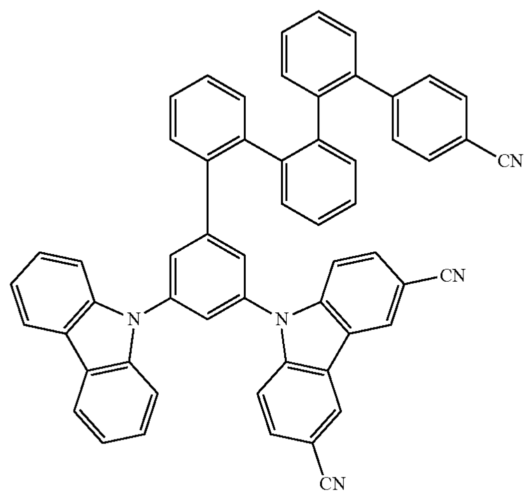
-continued
127
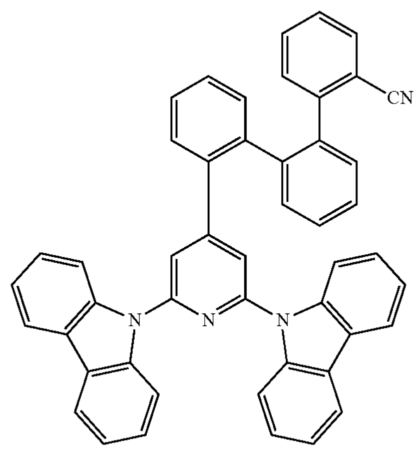
128
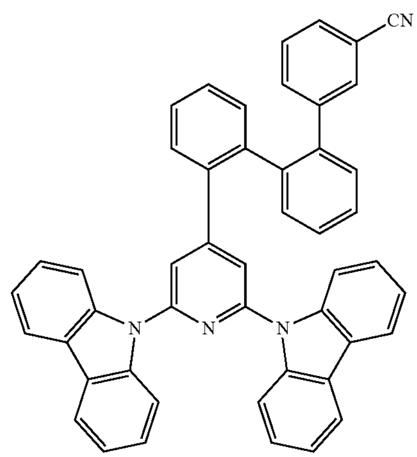
129
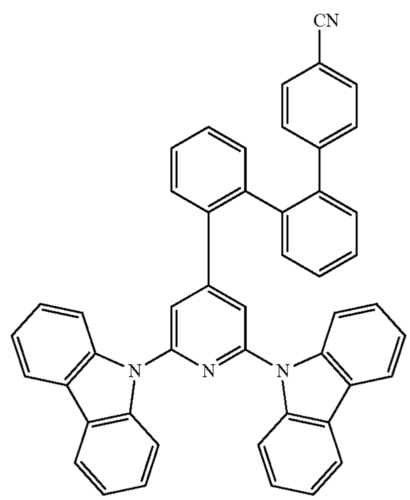

-continued
130
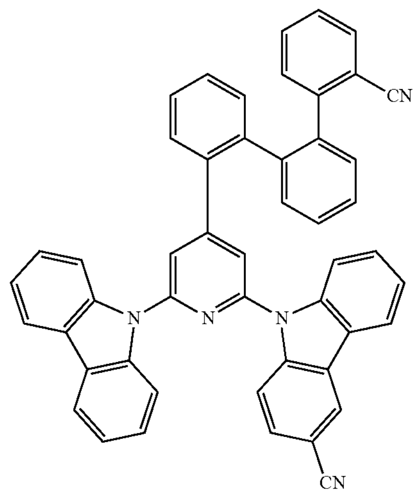
131
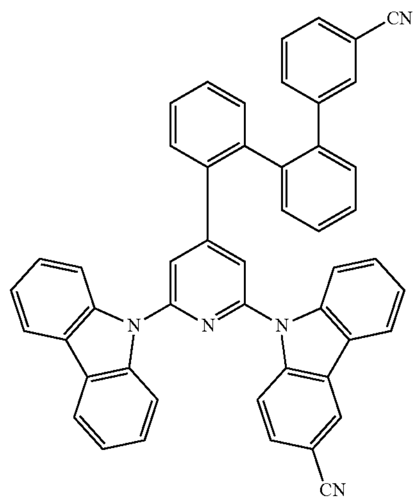
132
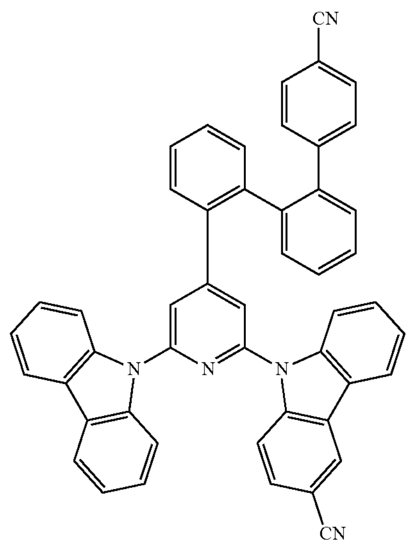
-continued
133
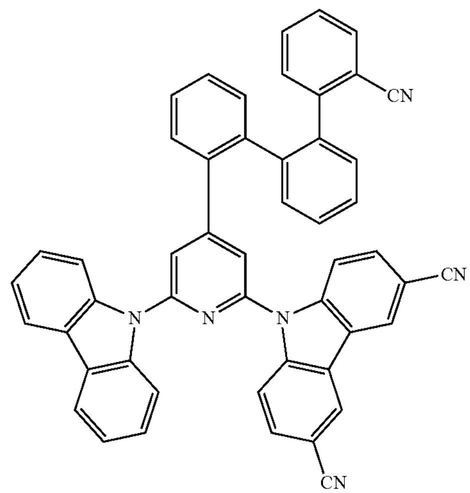
134
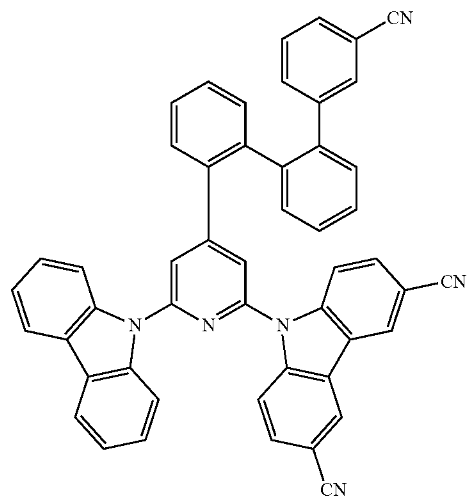
135
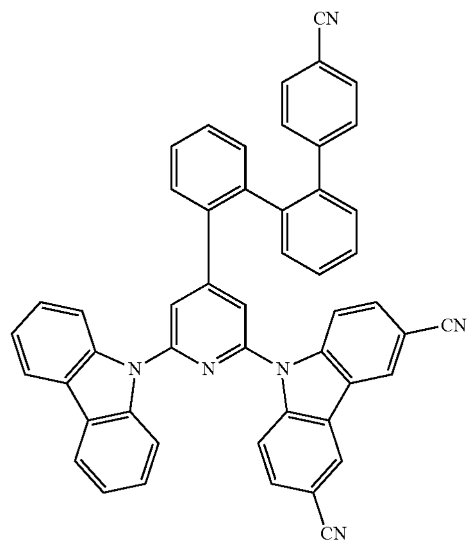

-continued
136
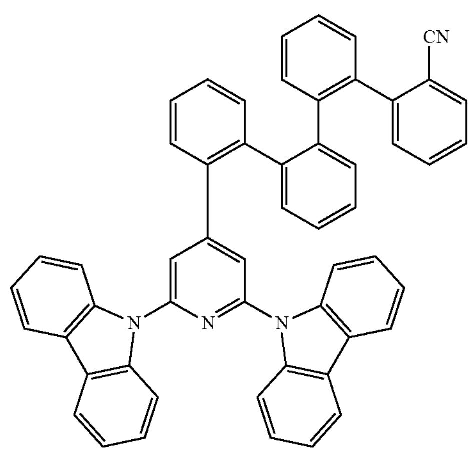
137
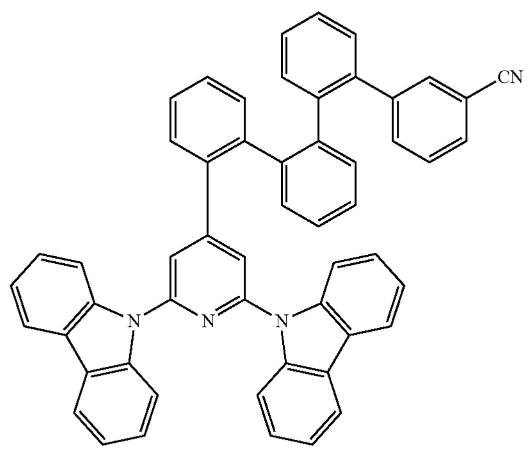
138
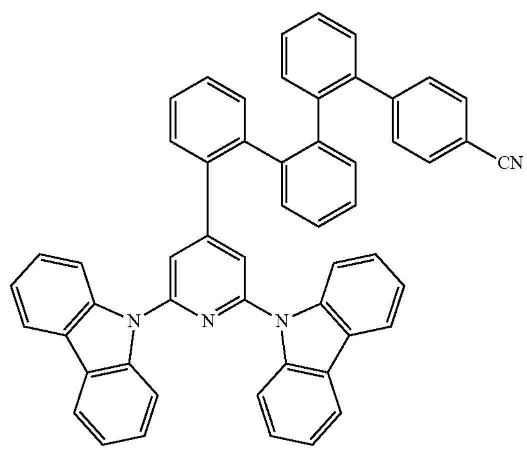
-continued
139
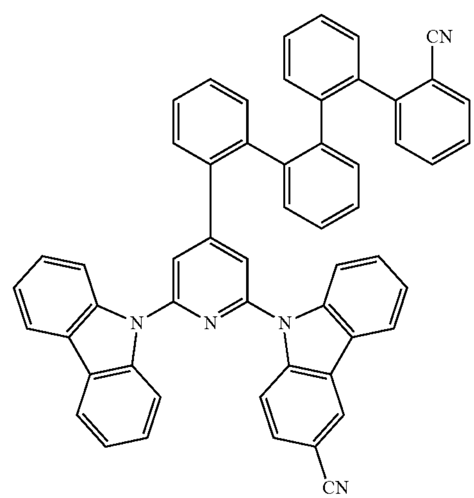
140
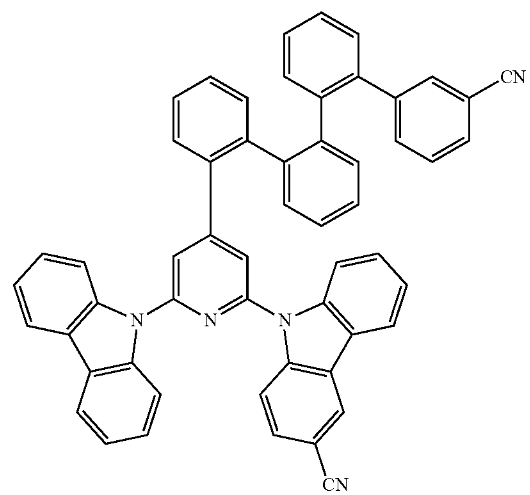
141
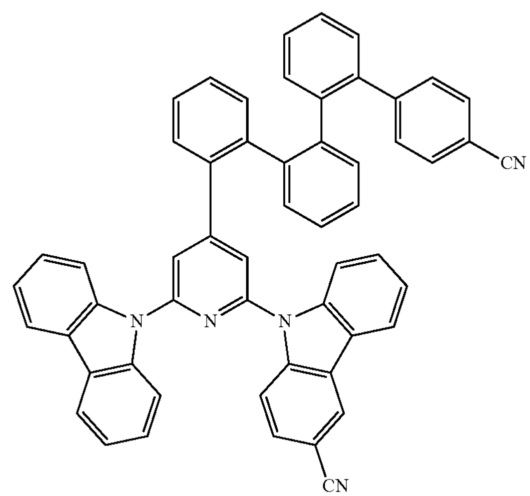

-continued
142
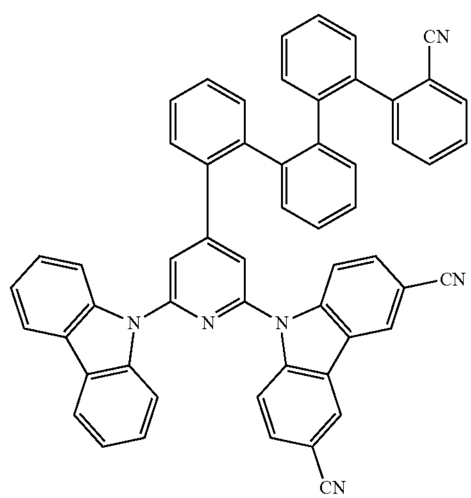
143
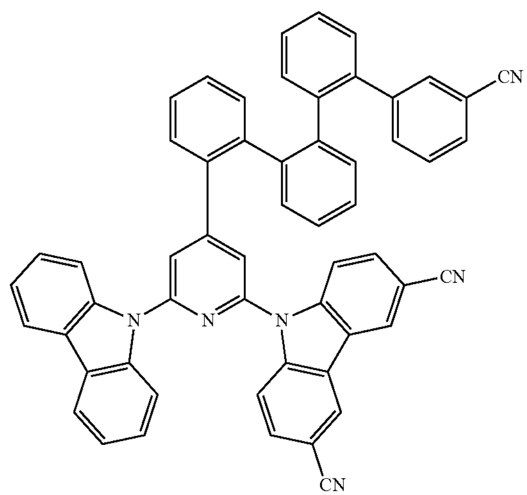
144
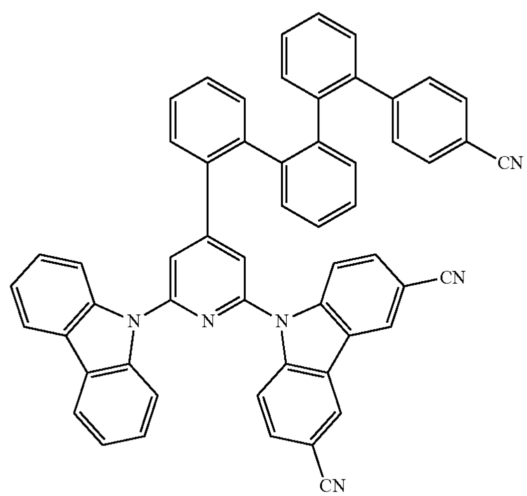
-continued
145
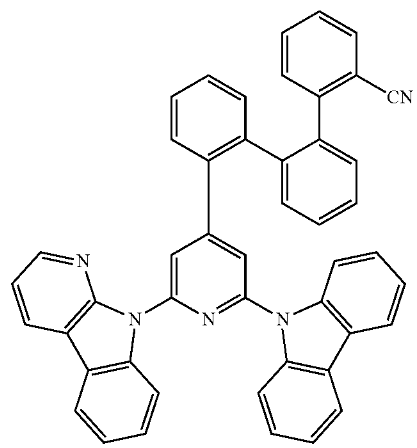
146
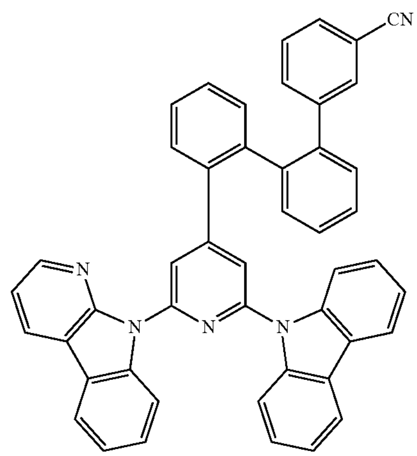
147
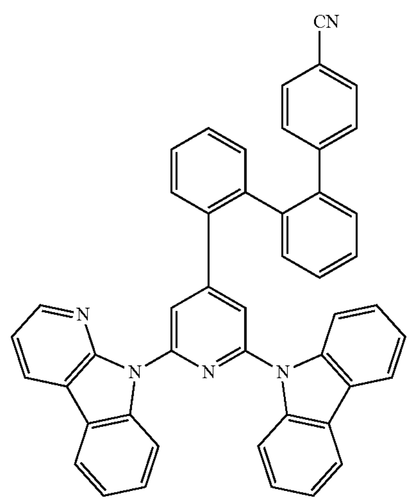

-continued
148
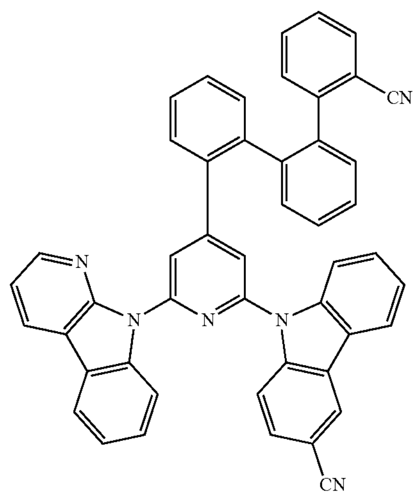
149
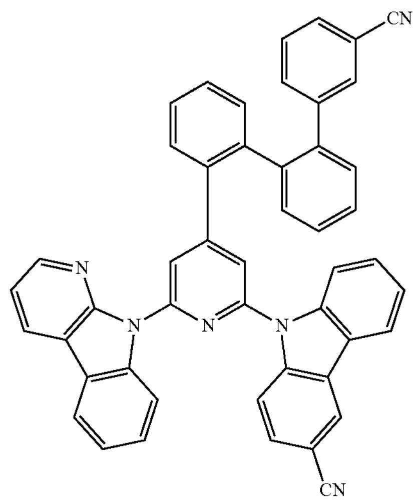
150
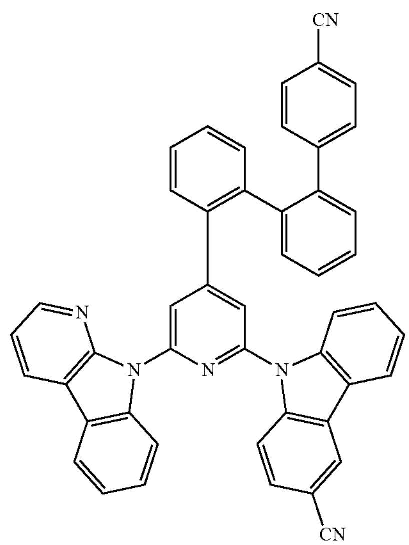
-continued
151
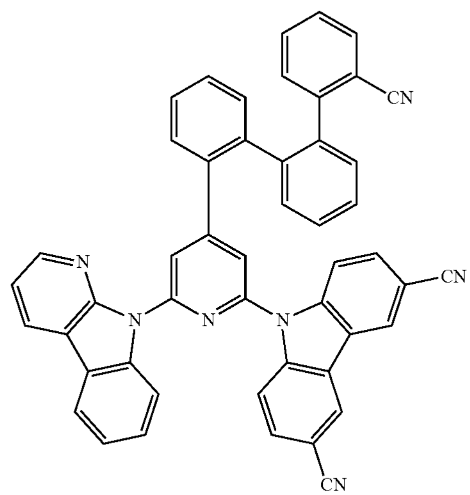
152
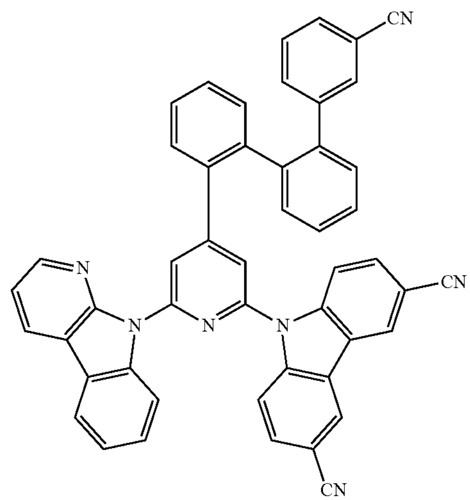
153
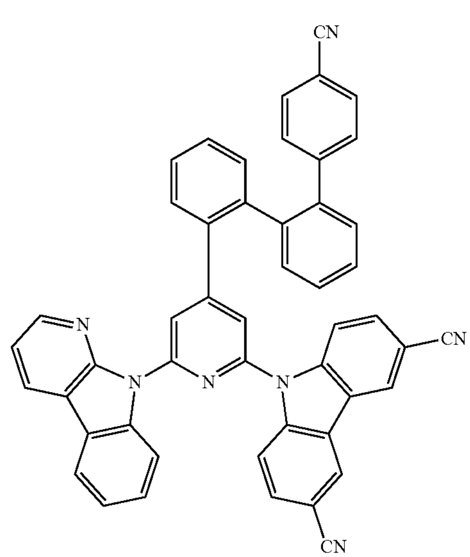

-continued
154
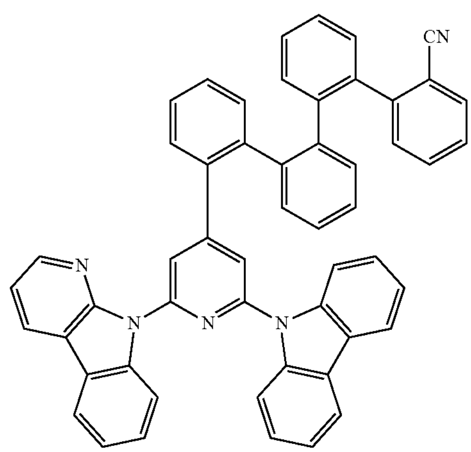
155
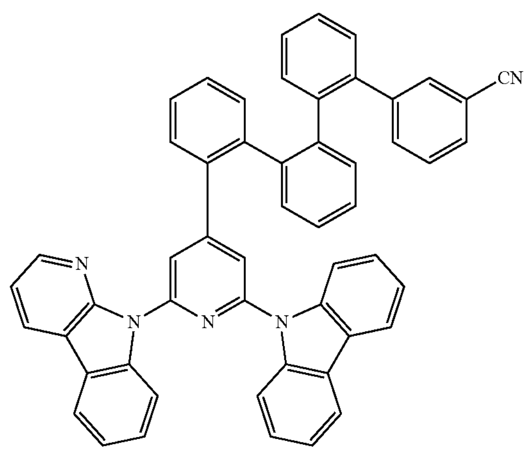
156
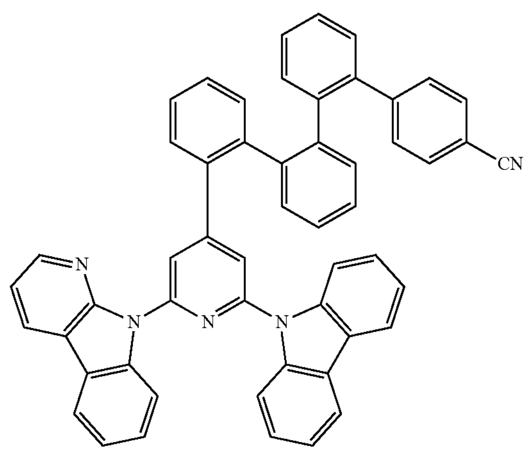
-continued
157
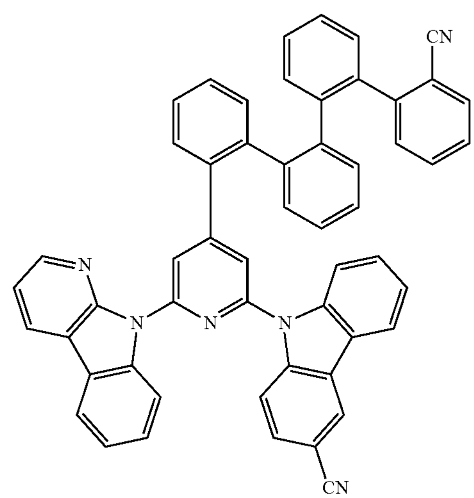
158
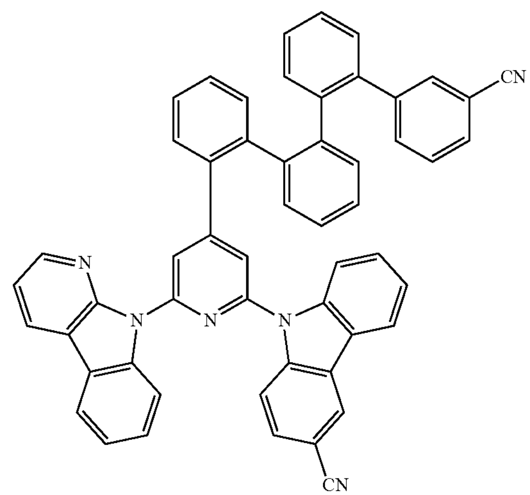
159
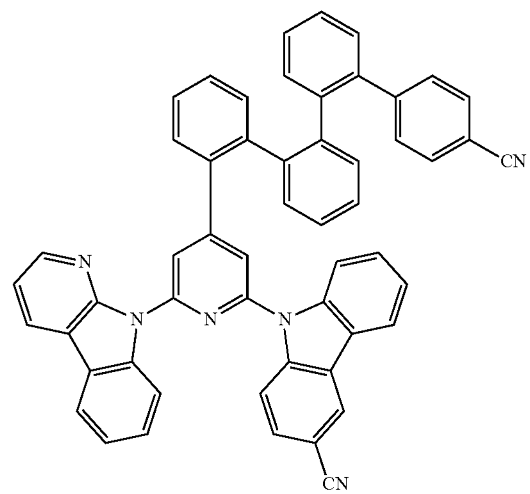

-continued
160
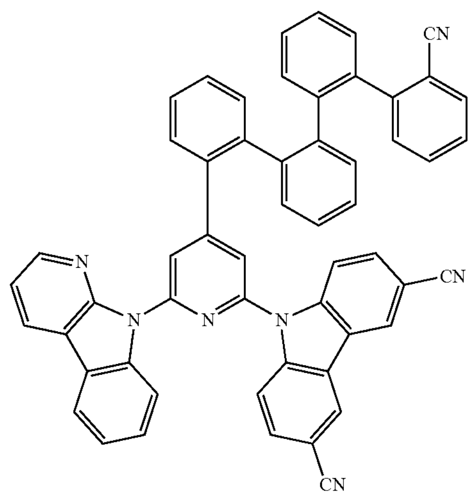
161
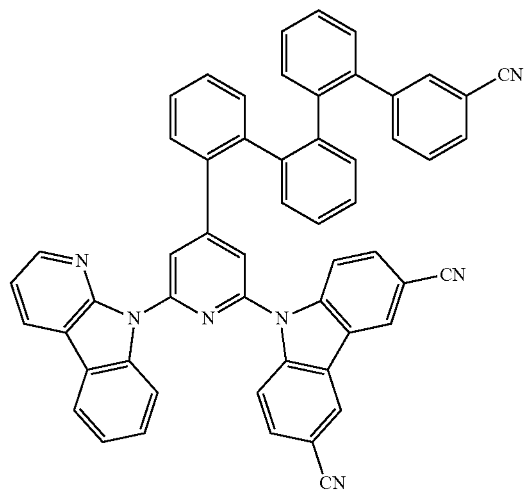
162
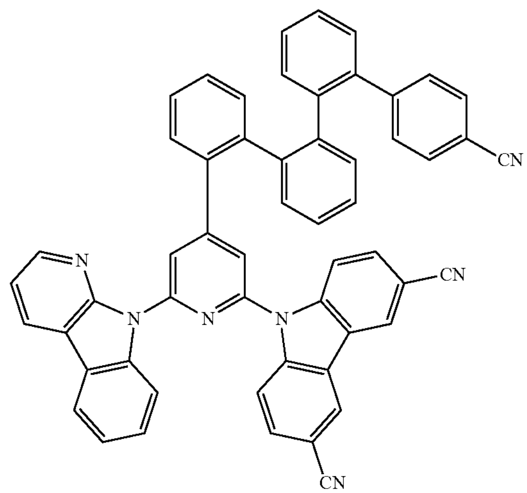
-continued
163
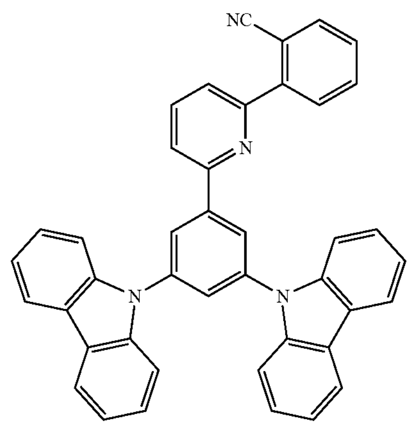
164
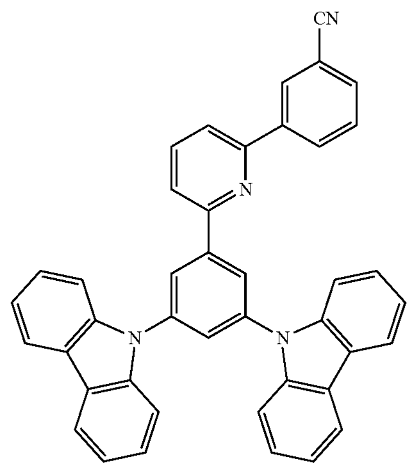
165
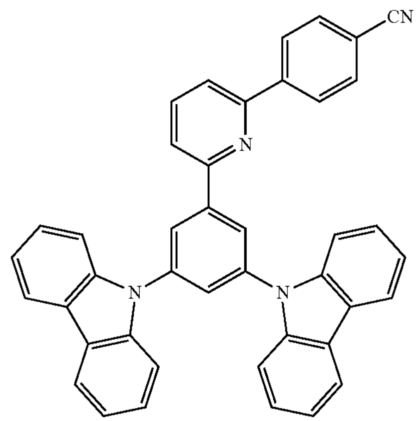

-continued
166
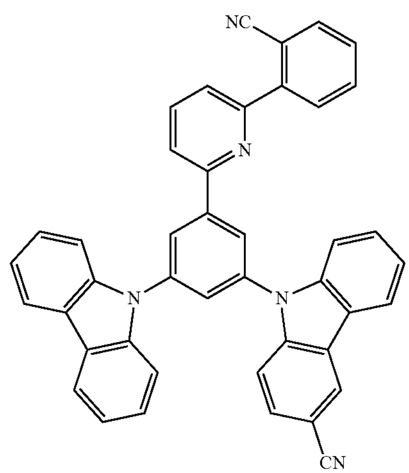
167
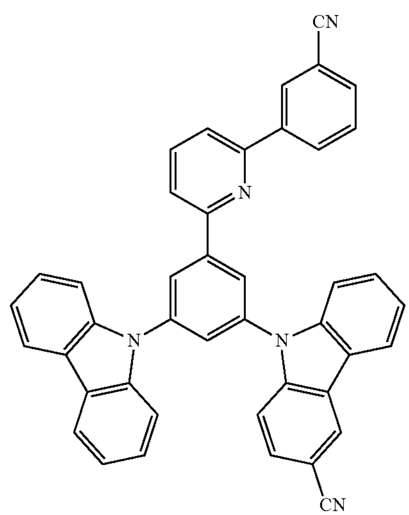
168
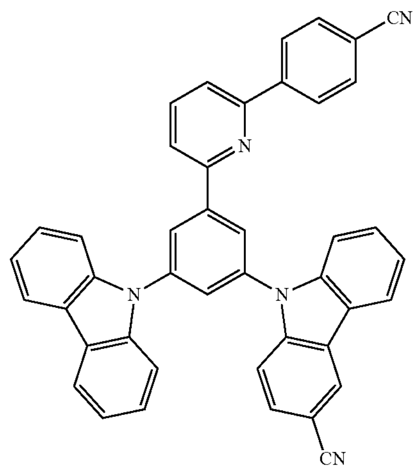
-continued
169
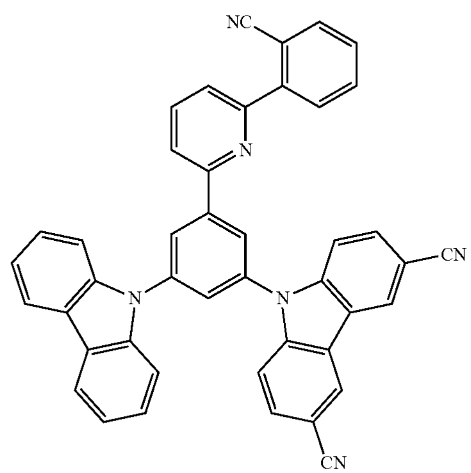
170
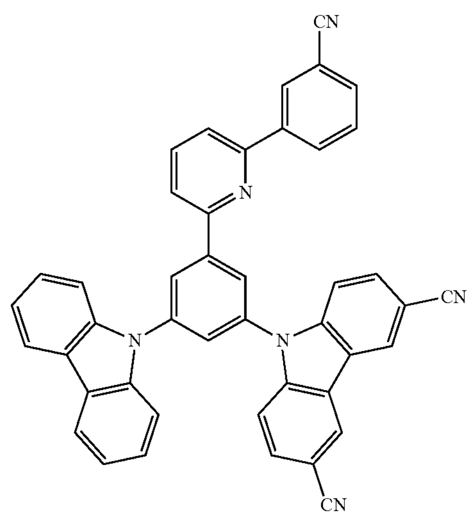
171
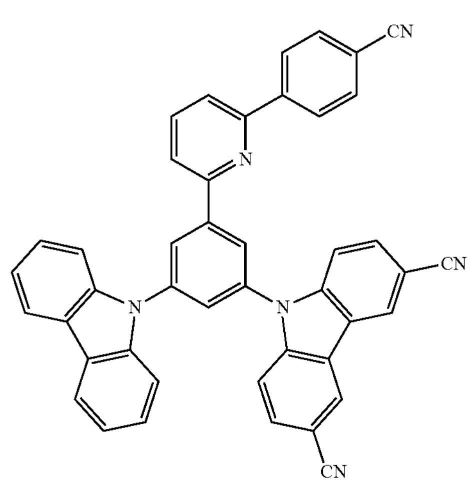

172
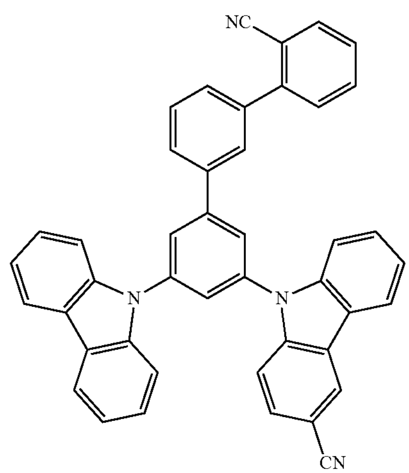
173
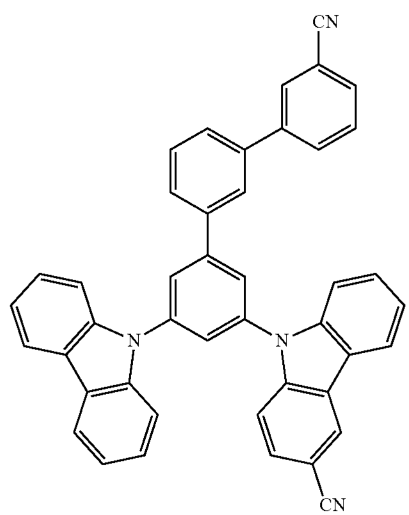
174
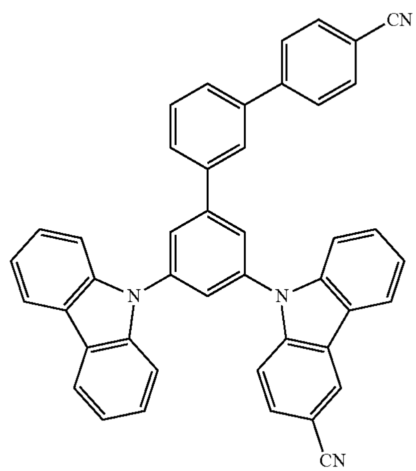
175
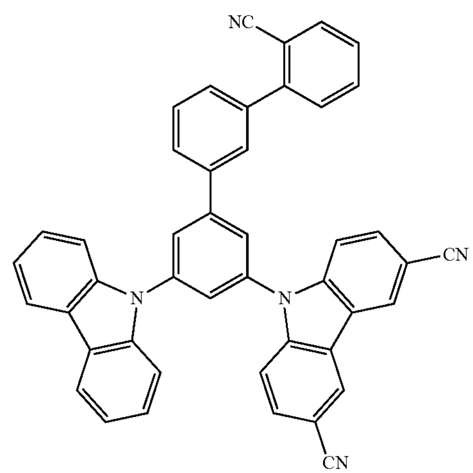
176
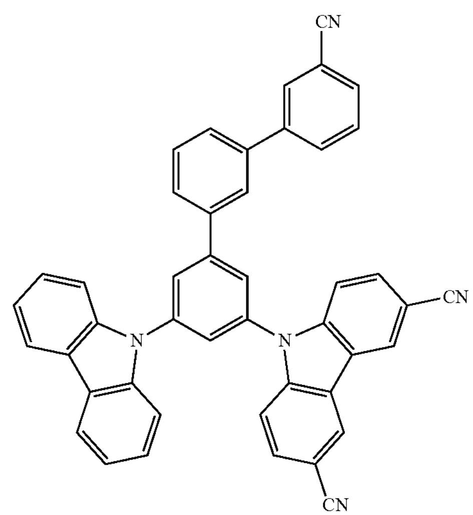
177
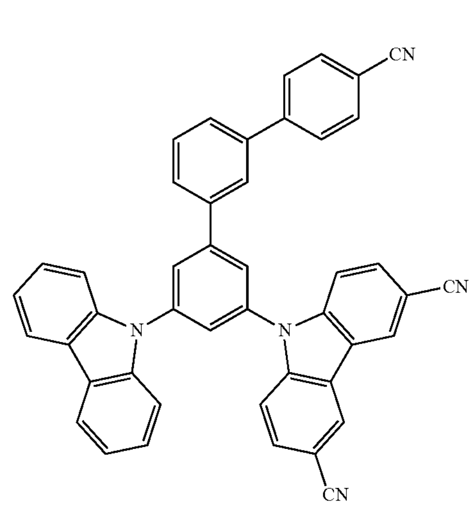

-continued
178
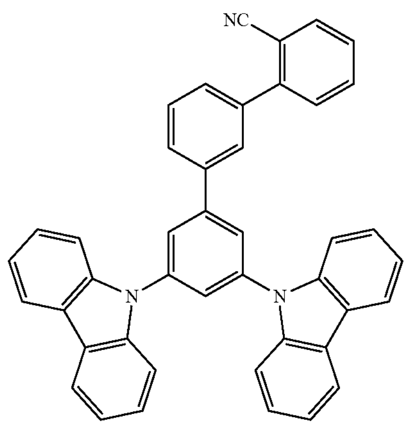
179
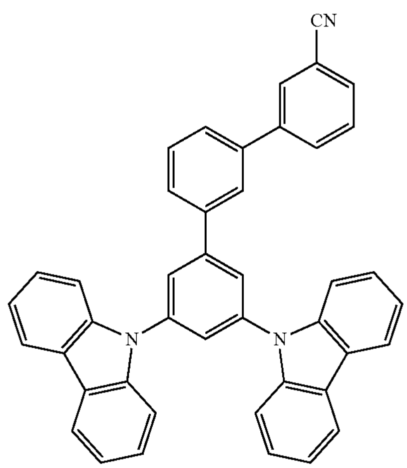
180
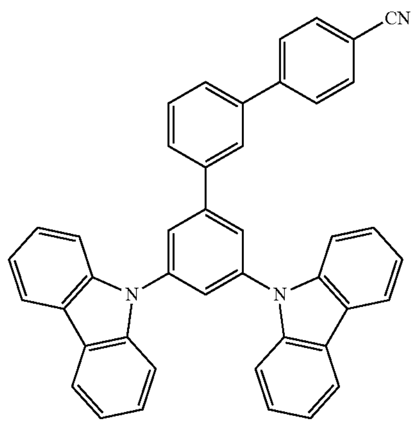
-continued
181
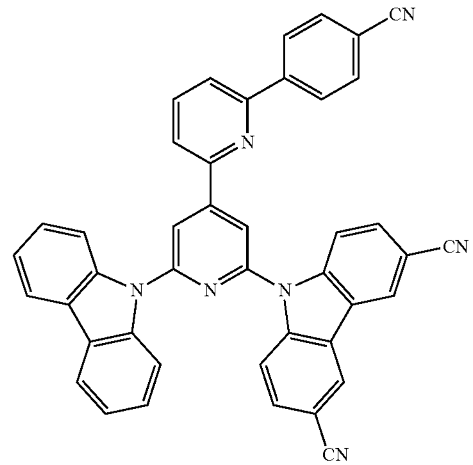
182
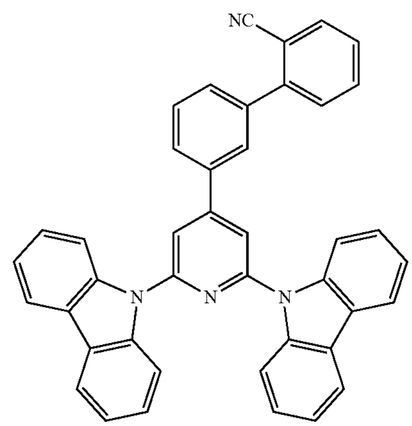
183
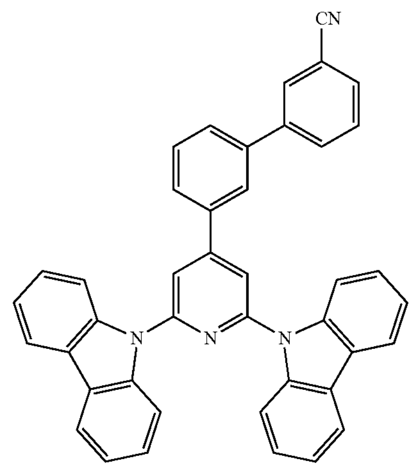

-continued
184
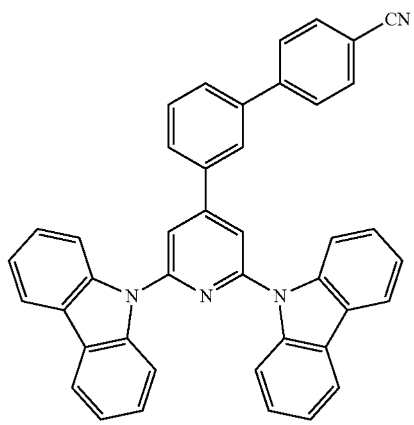
185
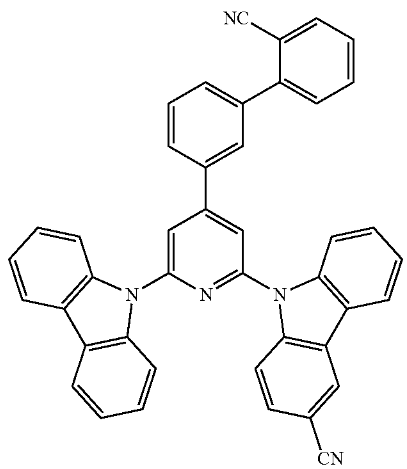
186
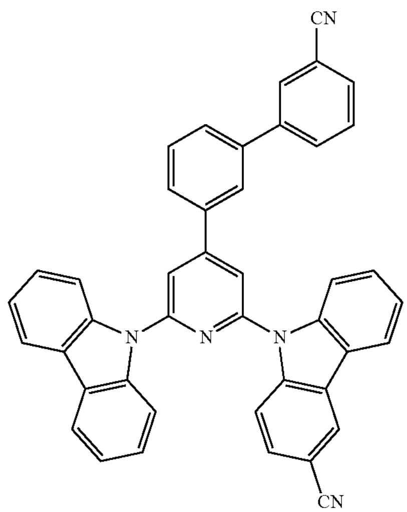
-continued
187
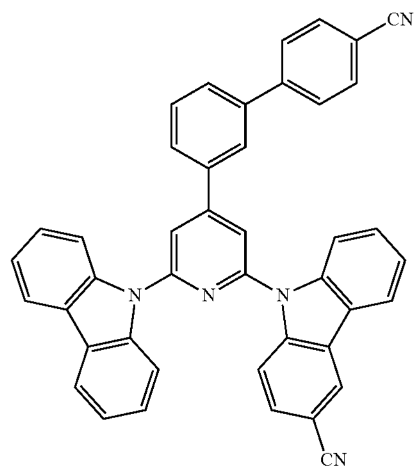
188
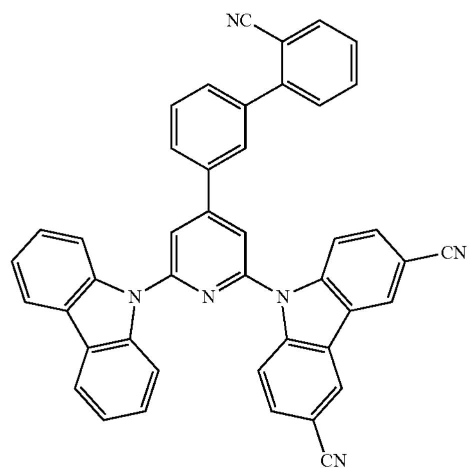
189
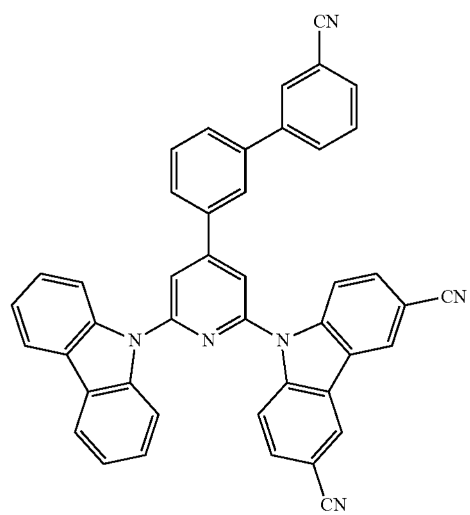

-continued
190
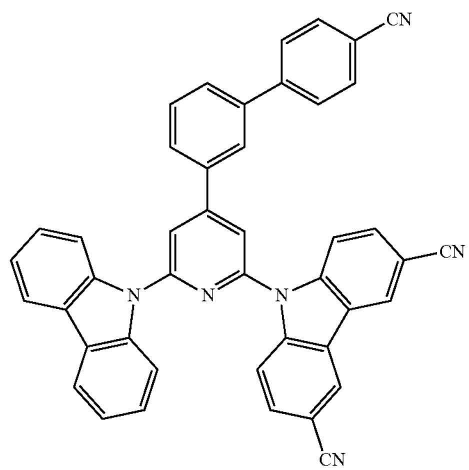
191
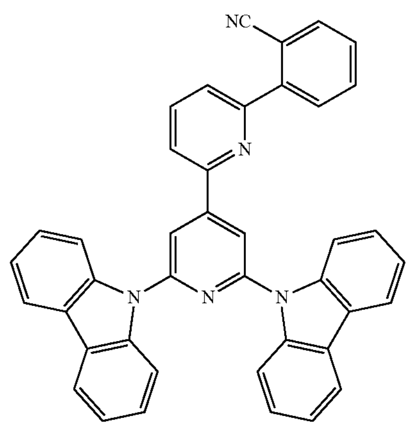
192
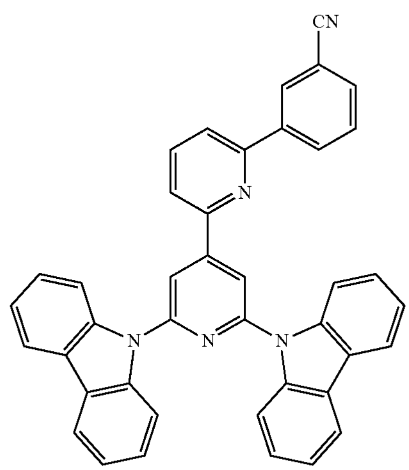
-continued
193
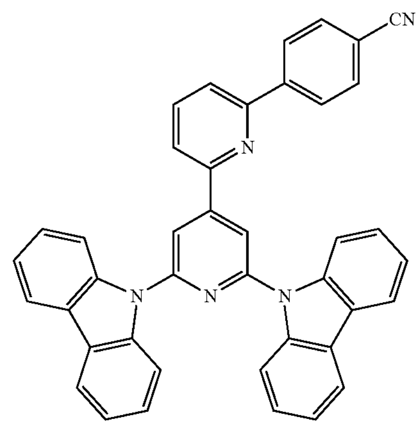
194
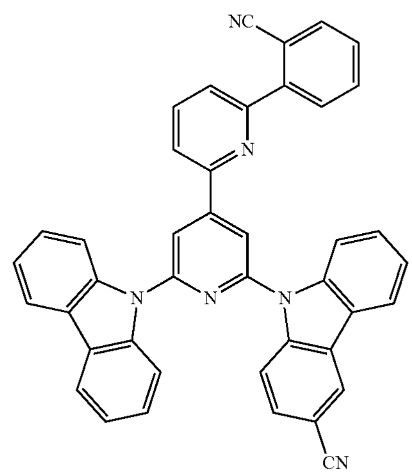
195
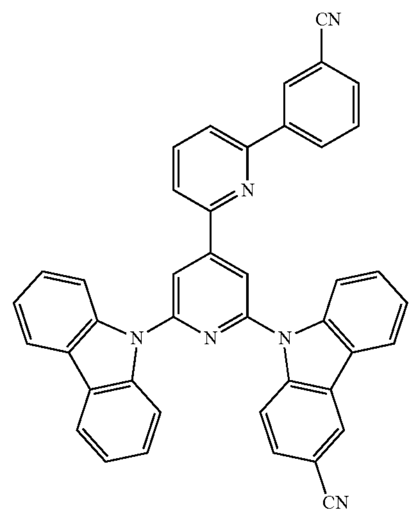

-continued
196
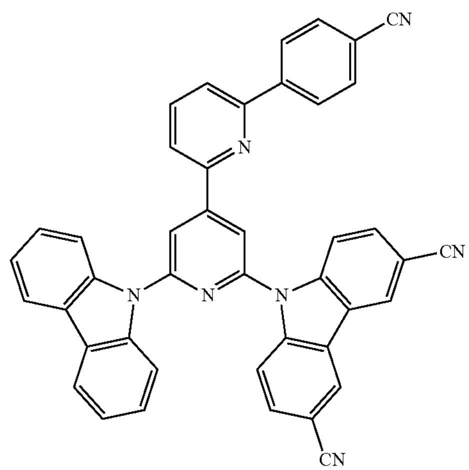
197
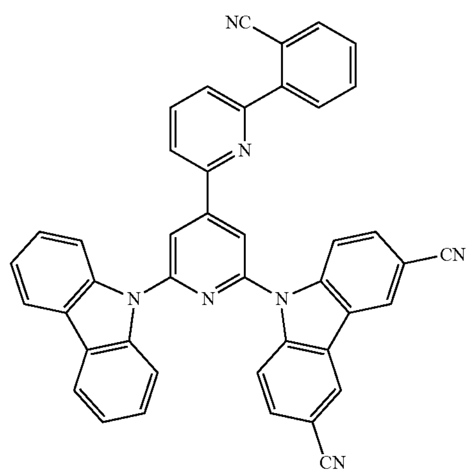
198
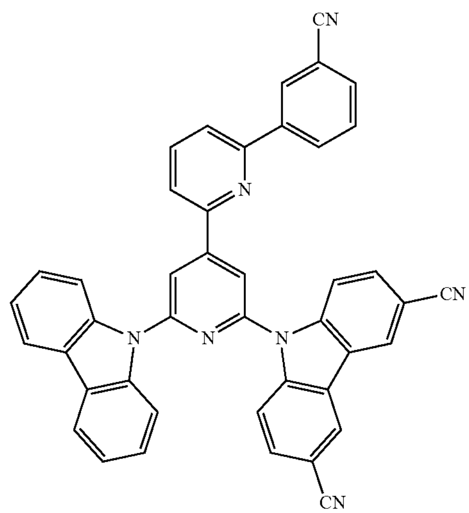
-continued
199
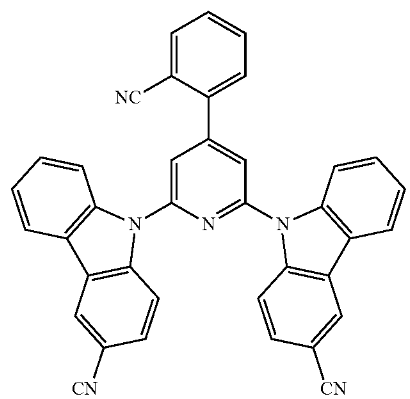
200
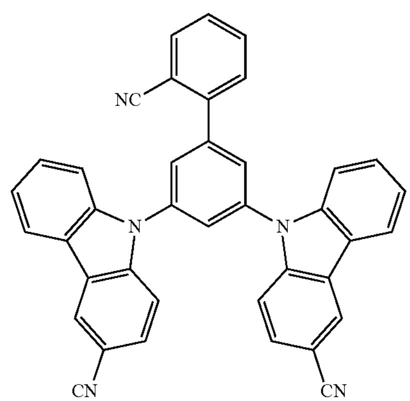
201
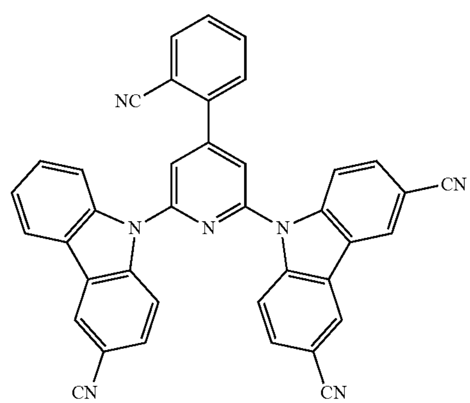
202
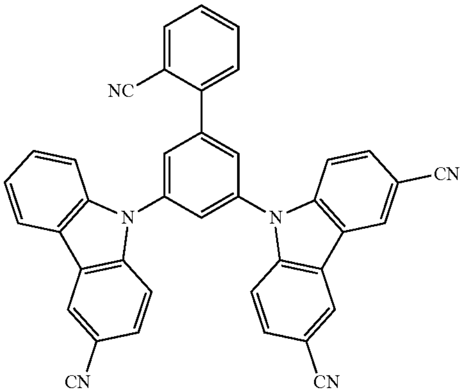

Group HE6
1
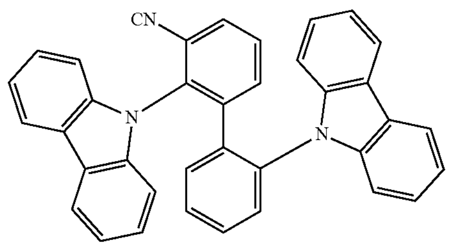
2
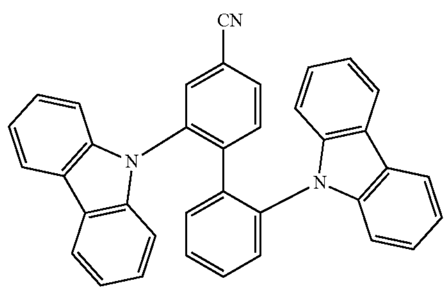
3
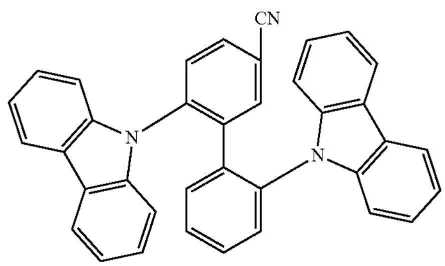
4
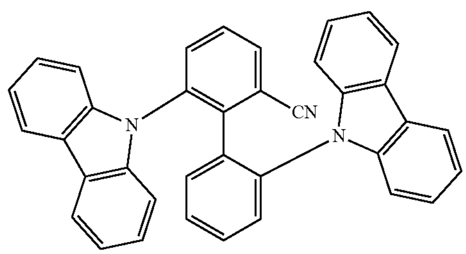
5
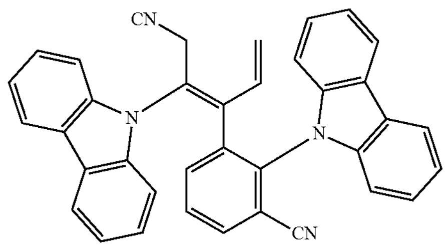
-continued
6
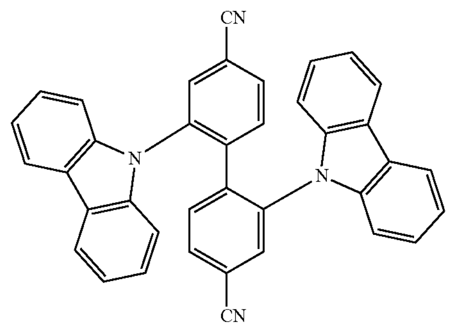
7
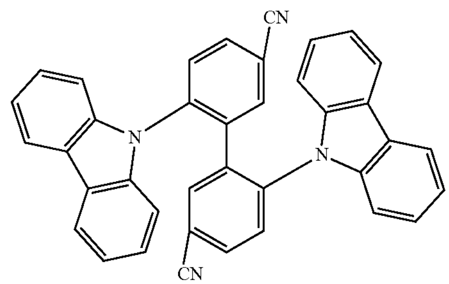
8
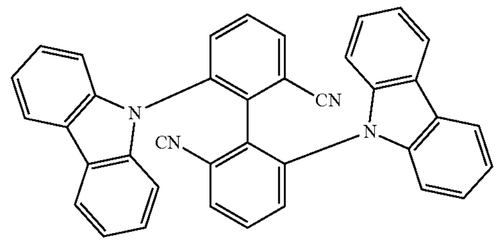
9
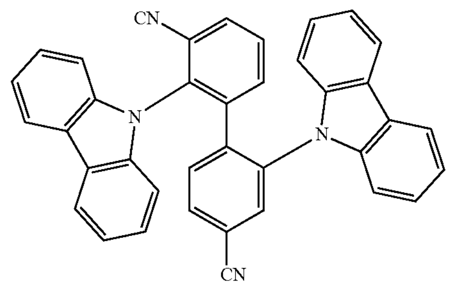
10
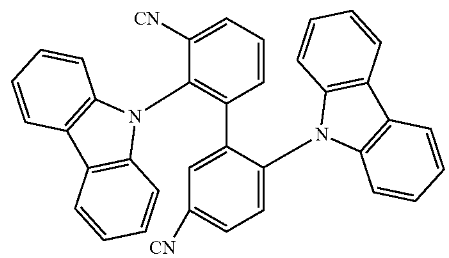
11
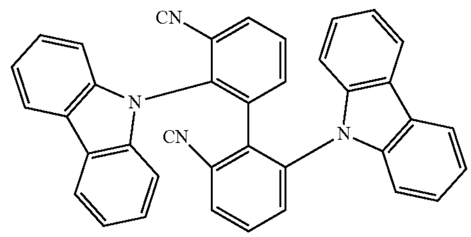

-continued
12
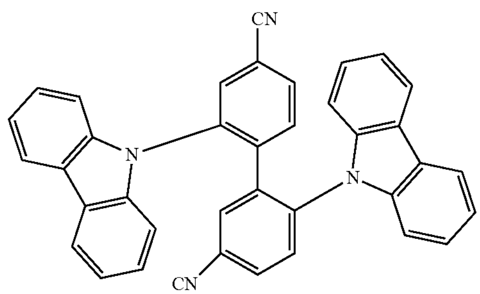
13
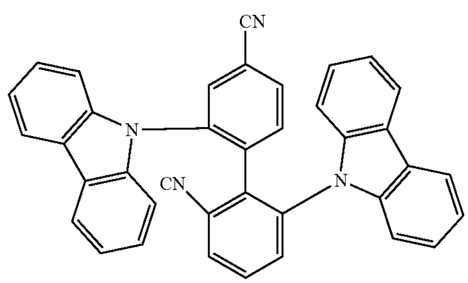
14
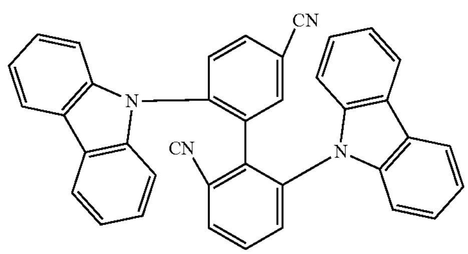
15
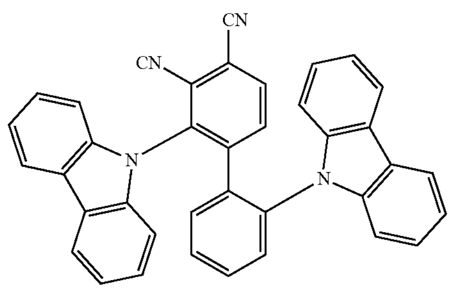
16
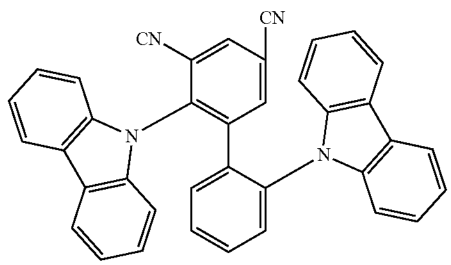
17
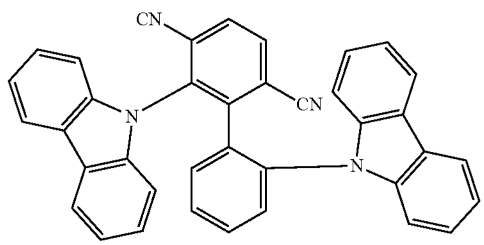
-continued
18
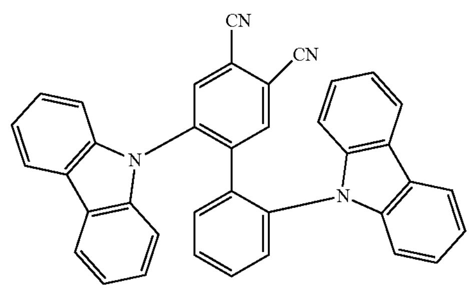
19
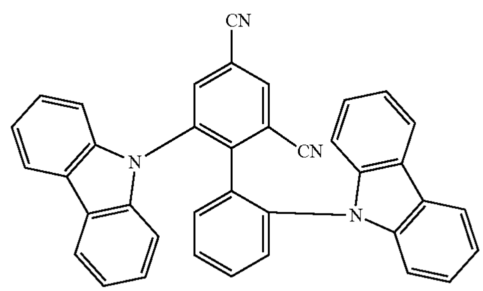
20
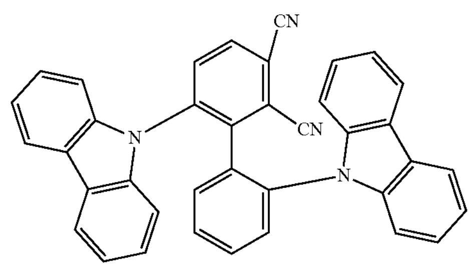
21
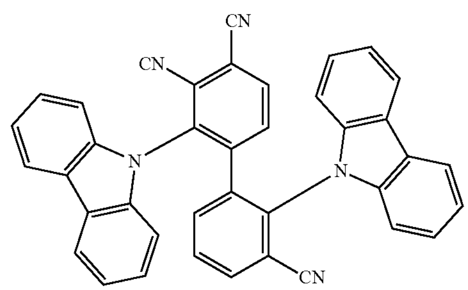
22
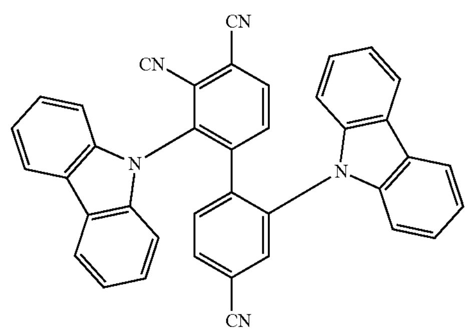

-continued
23
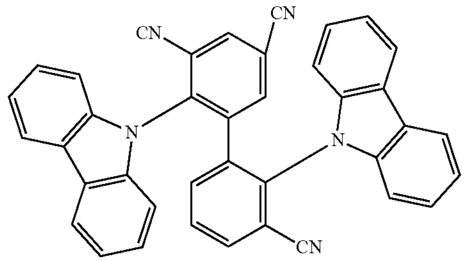
24
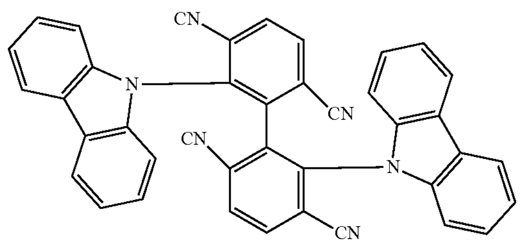
25
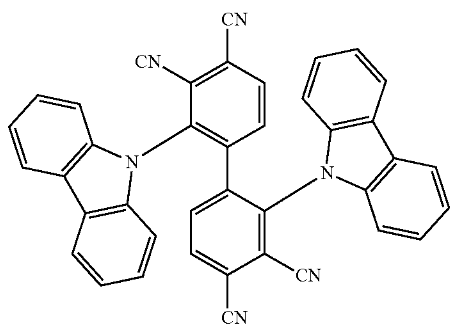
26
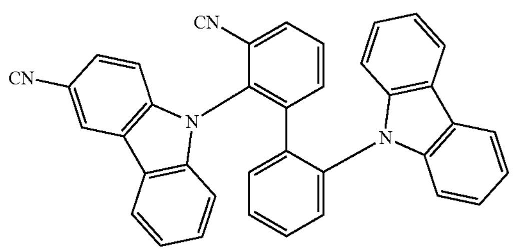
27
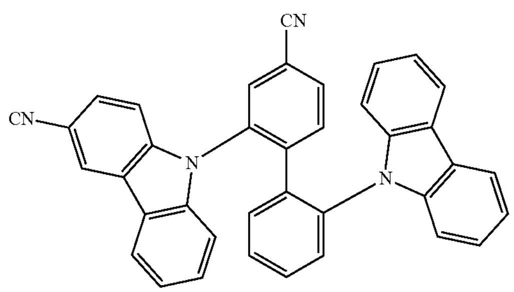
-continued
28
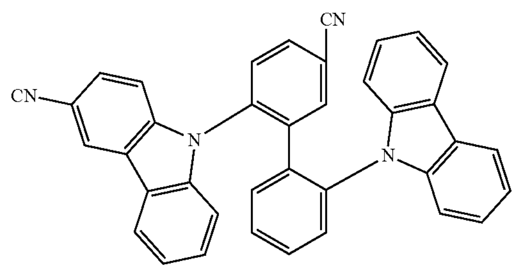
29
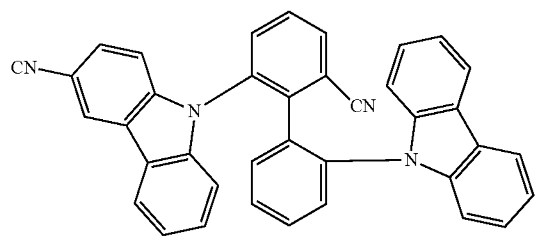
30
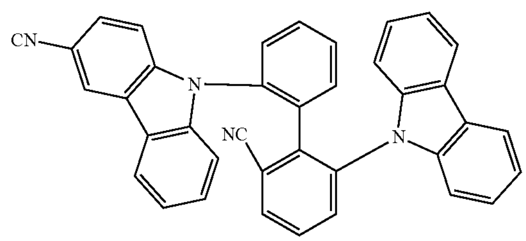
31
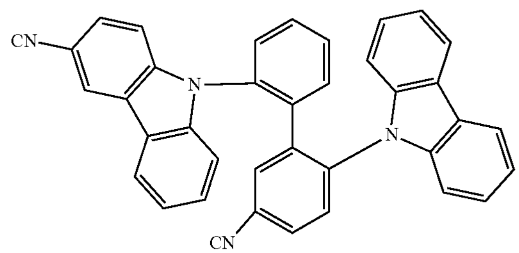
32
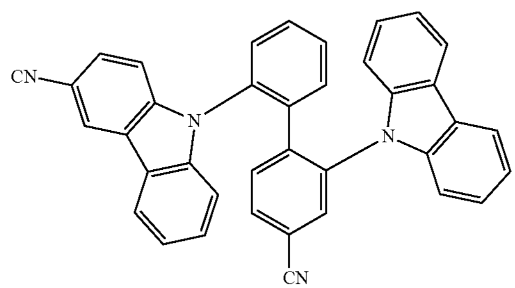

-continued
33
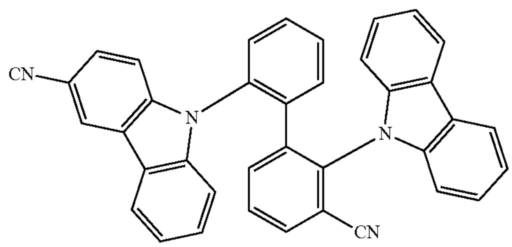
34
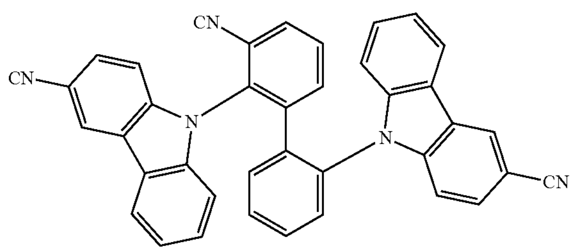
35
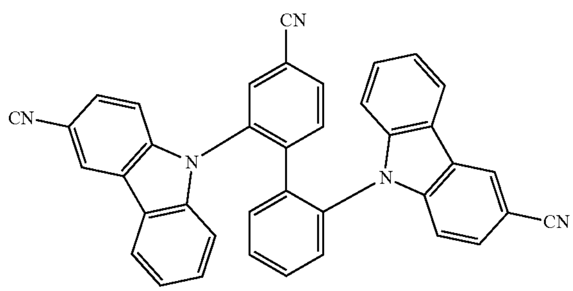
36
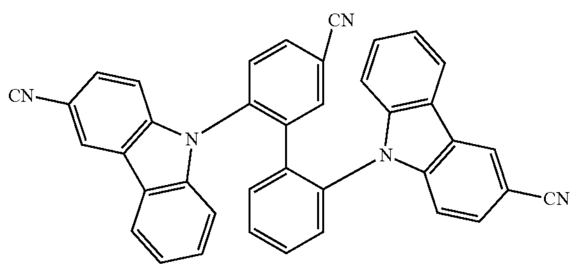
37
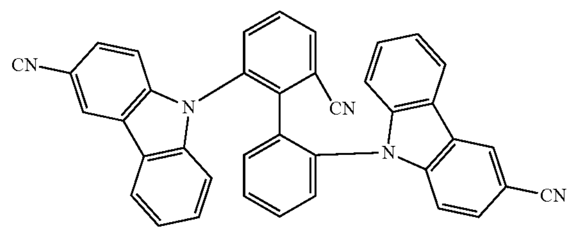
-continued
38
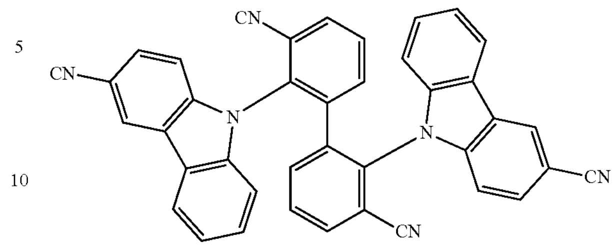
39
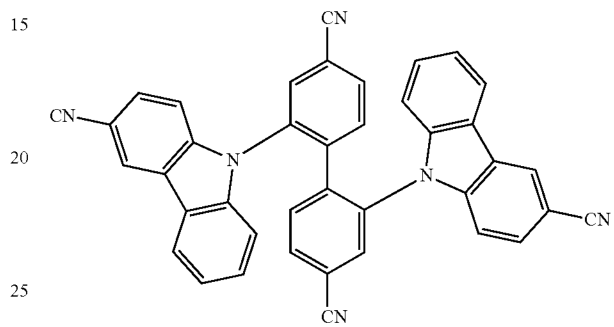
40
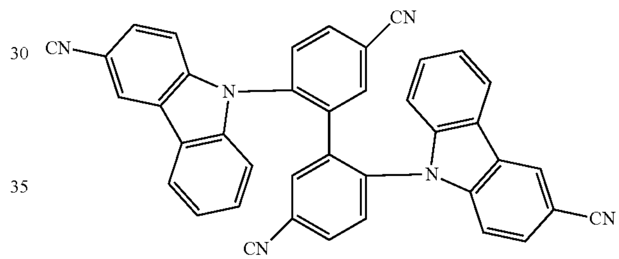
41
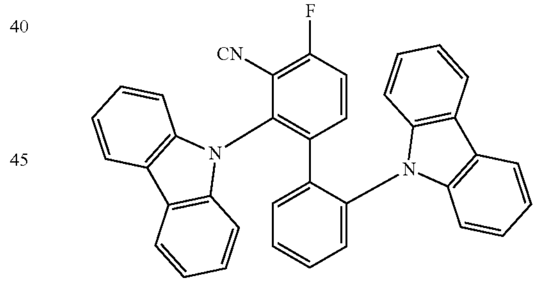
42
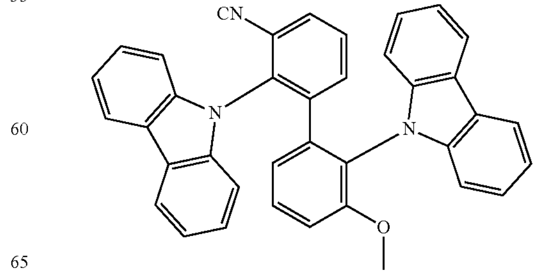

-continued
43
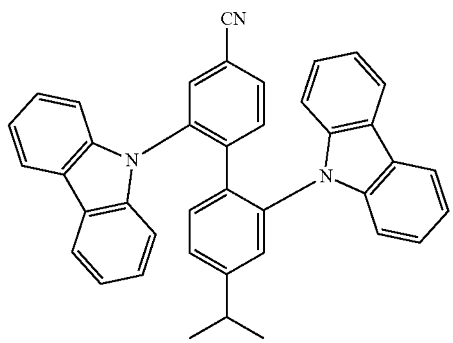
44
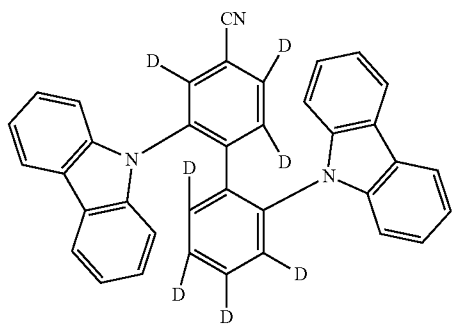
45
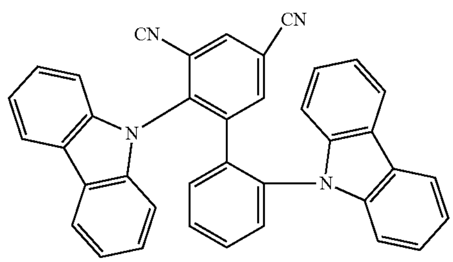
46
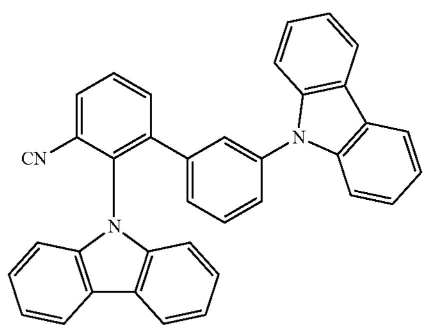
47
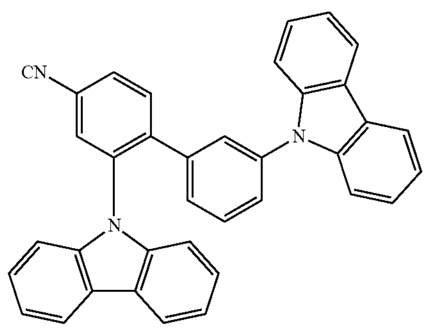
-continued
48
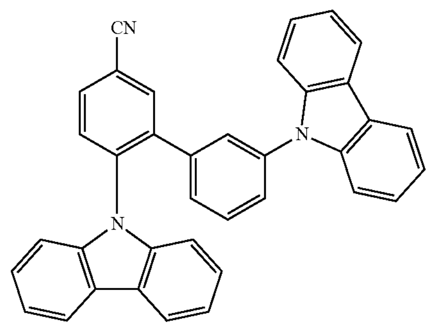
49
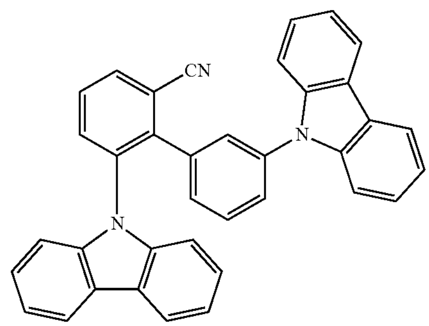
50
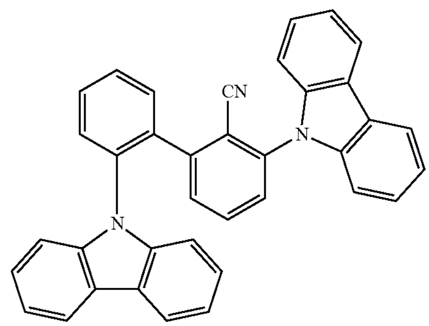
51
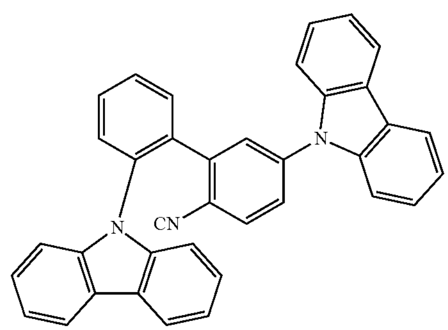
52
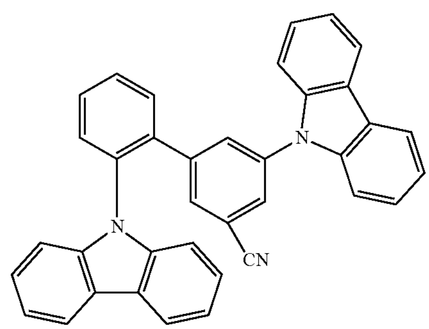

-continued
53
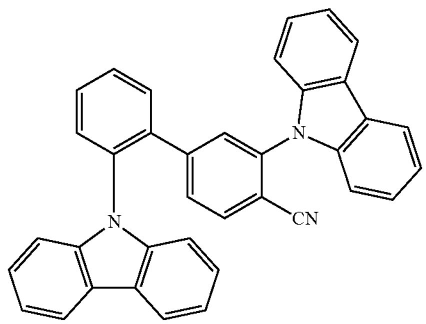
54
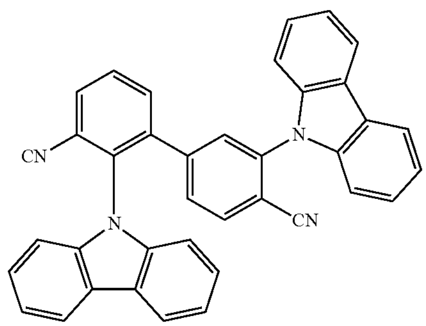
55
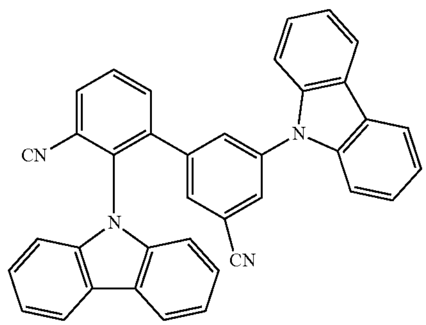
56
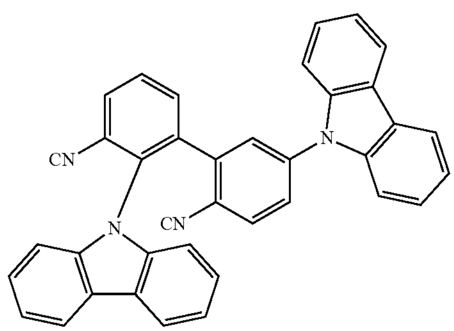
57
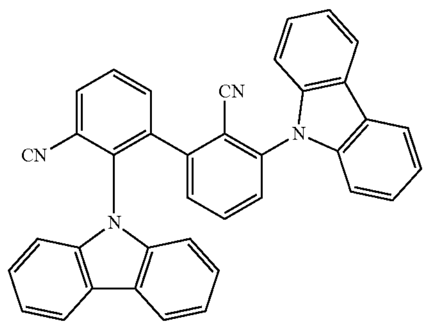
-continued
58
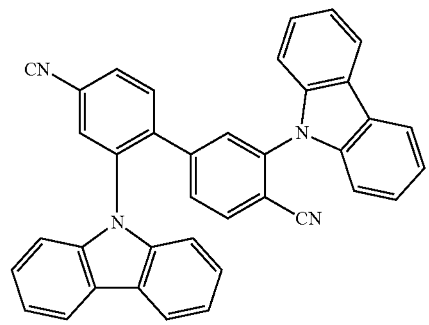
59
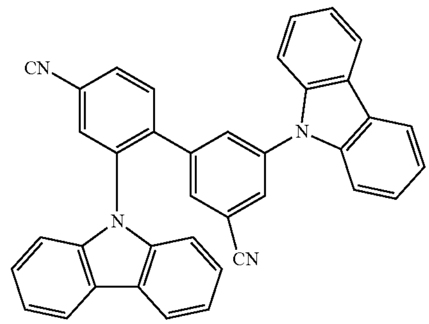
60
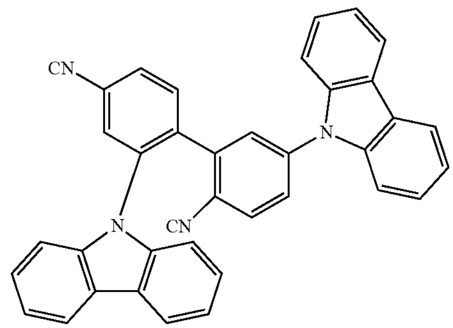
61
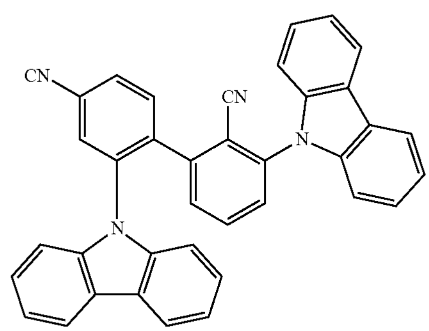
62
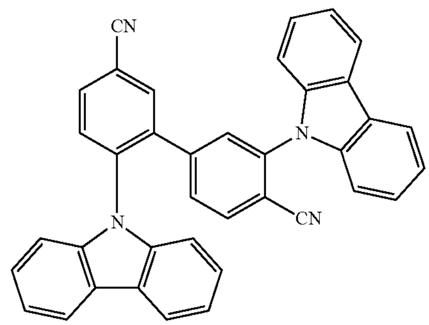

-continued
63
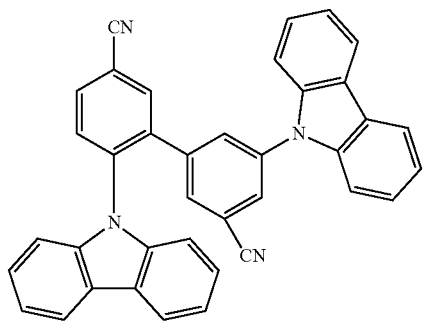
64
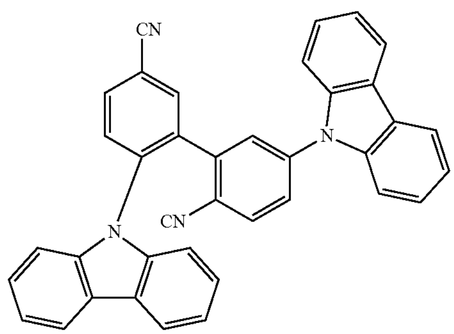
65
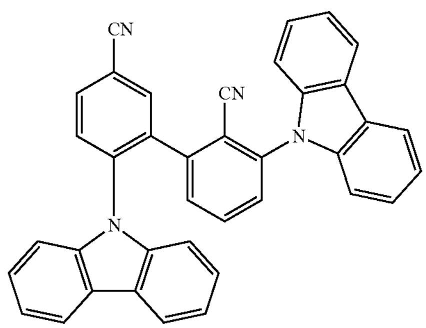
66
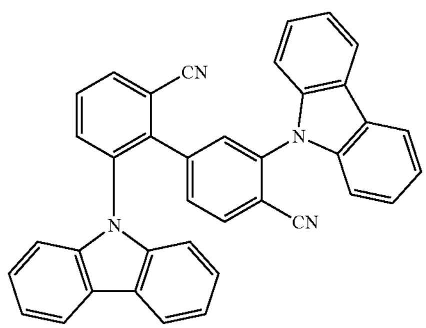
67
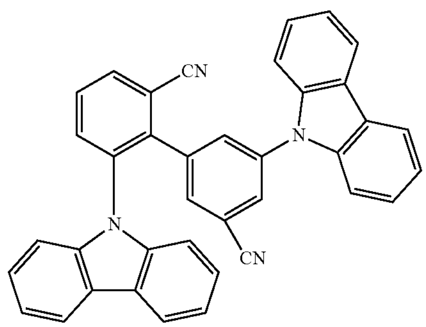
-continued
68
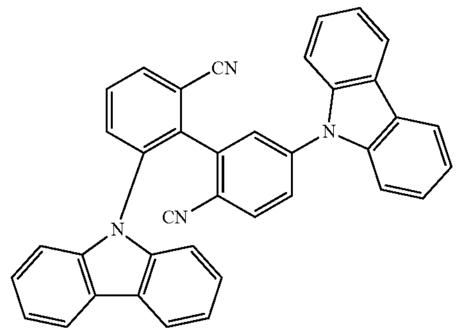
69
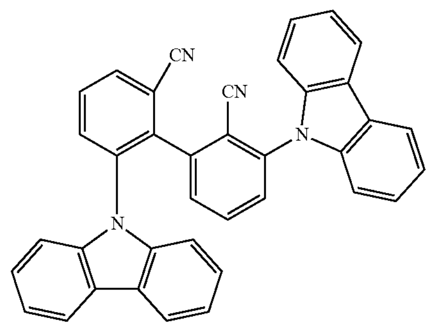
70
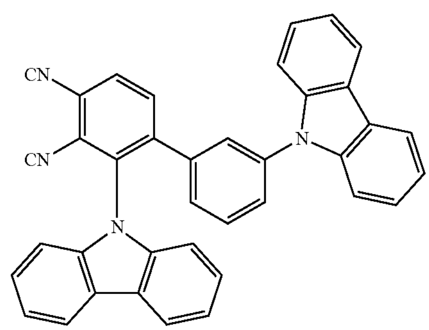
71
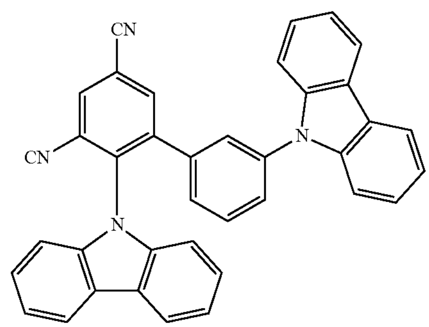
72
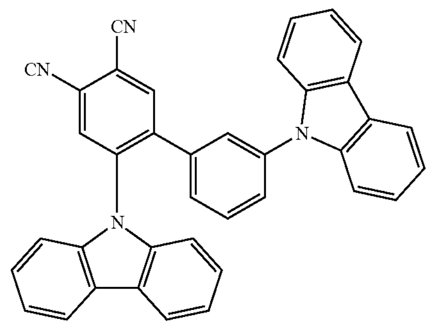

-continued
73
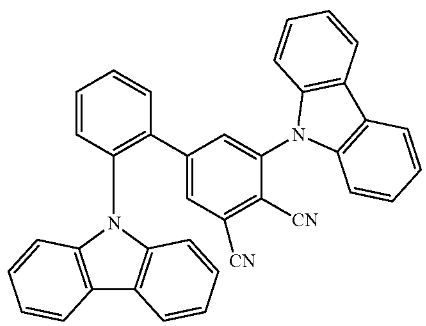
74
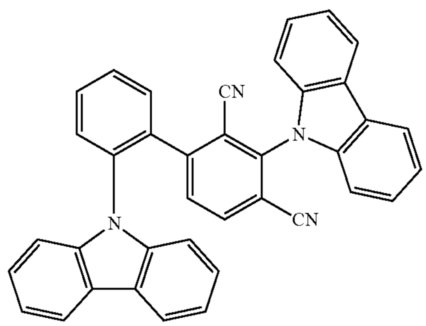
75
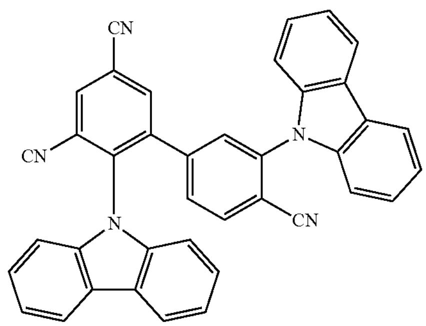
76
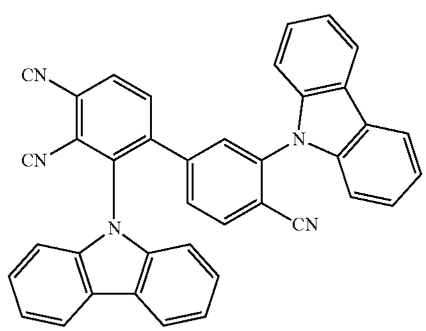
77
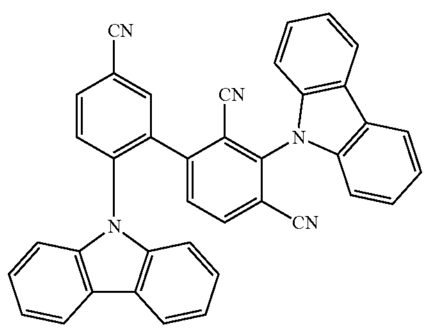
-continued
78
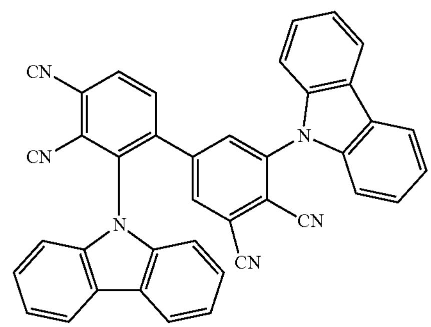
79
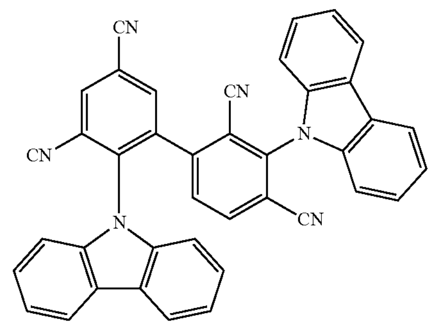
80
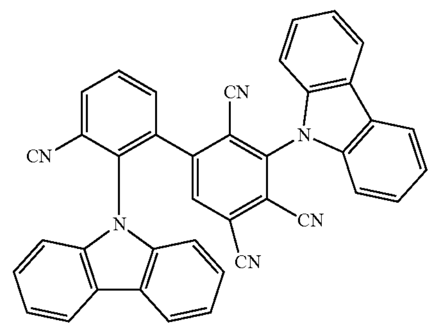
81
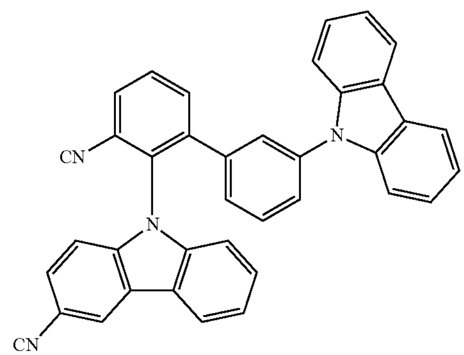

-continued
82
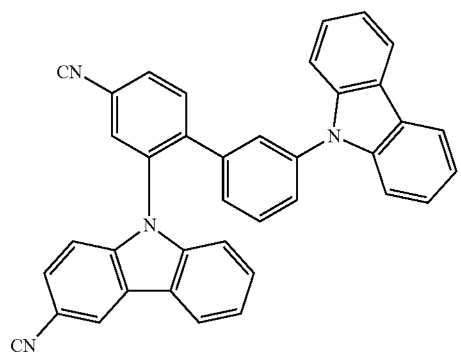
83
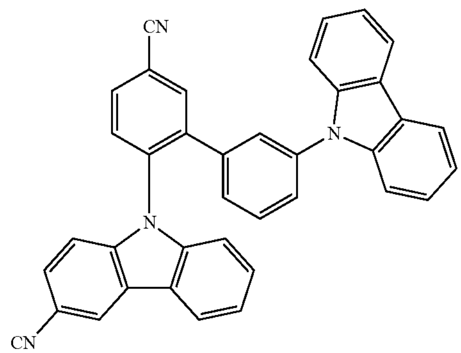
84
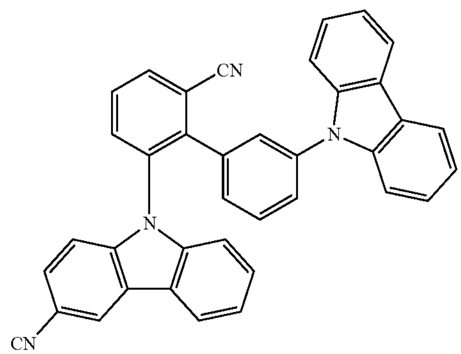
85
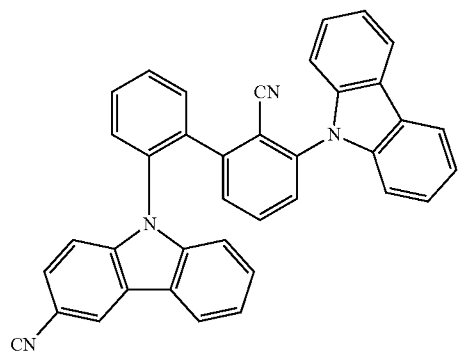
-continued
86
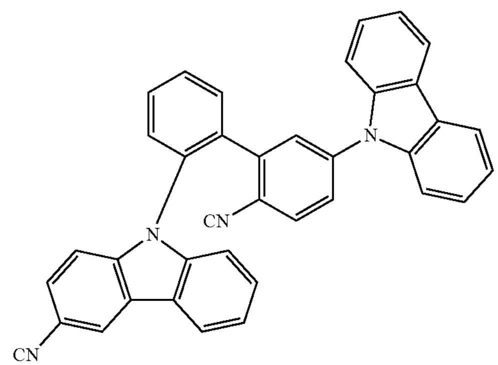
87
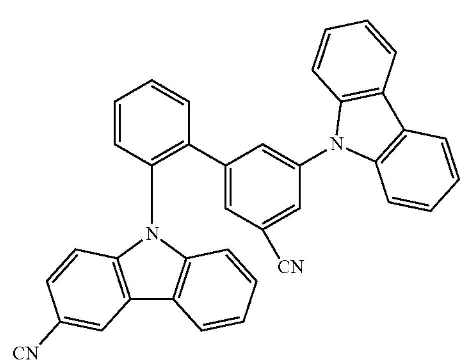
88
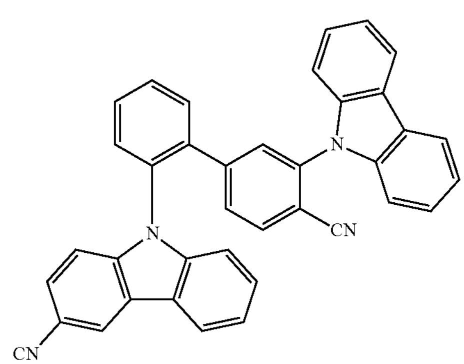
89
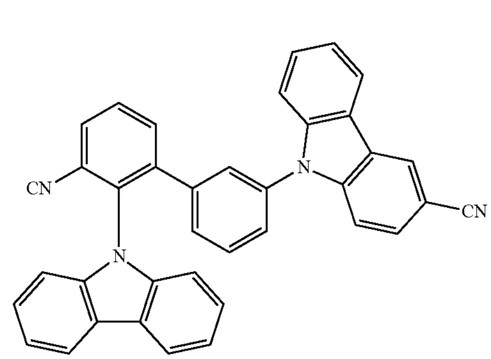

90
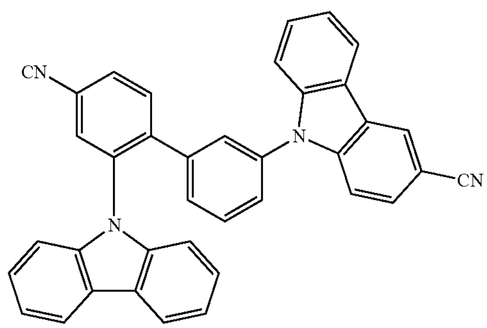
91
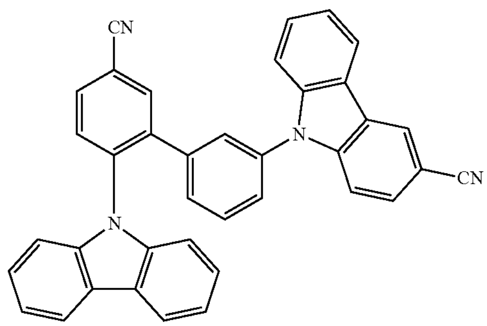
92
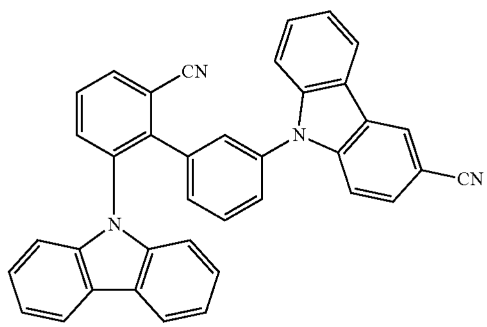
93
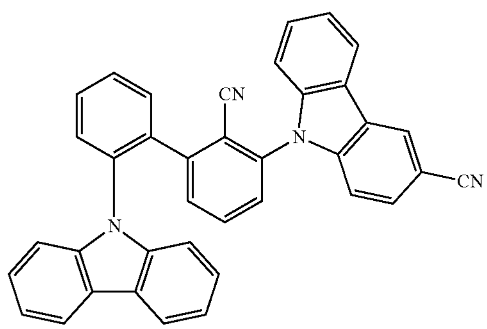
94
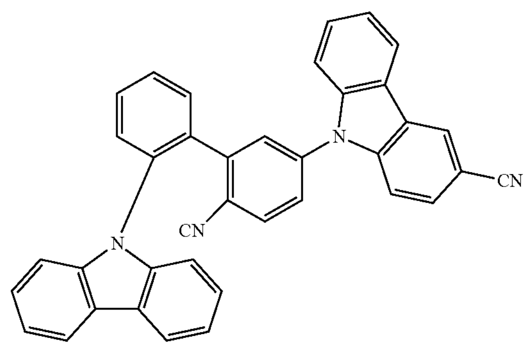
95
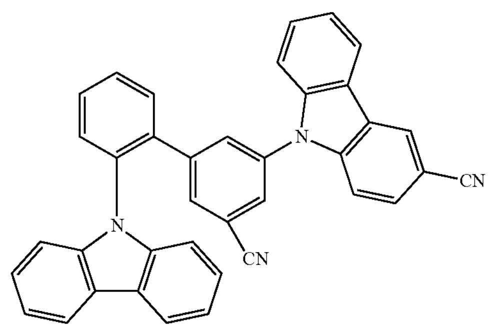
96
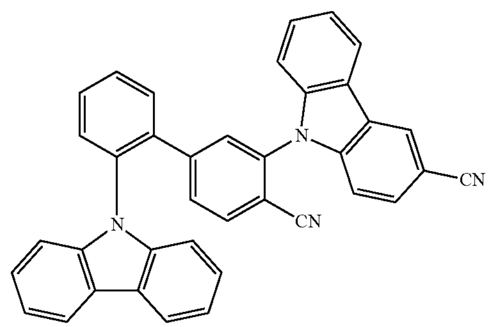
97
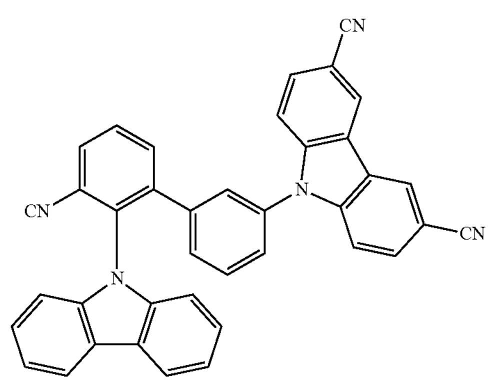

-continued
98
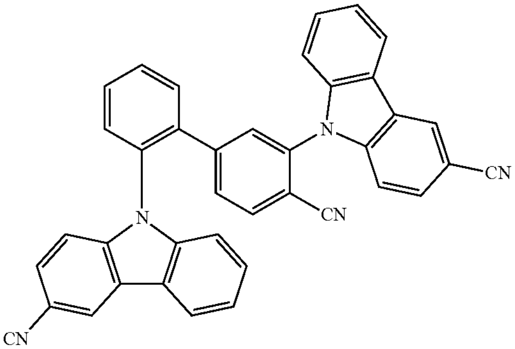
99
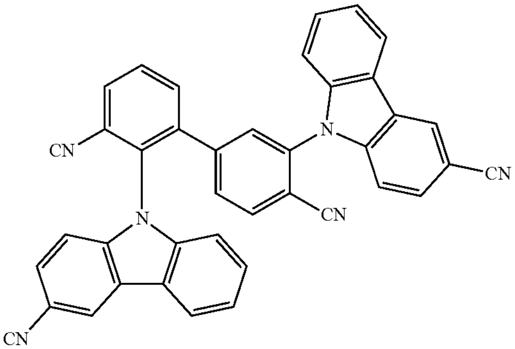
100
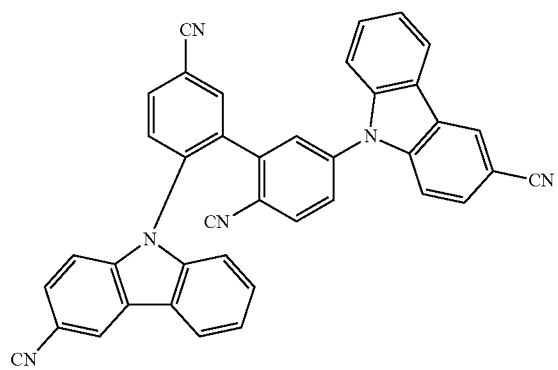
101
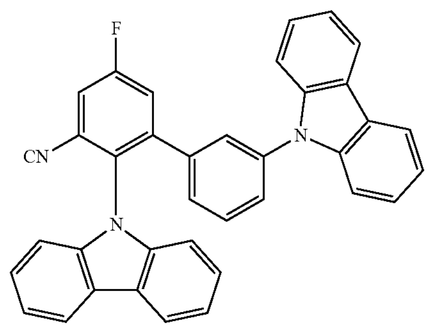
-continued
102
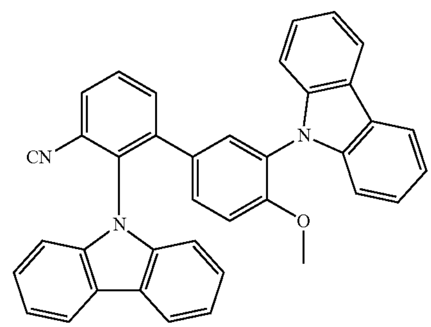
103
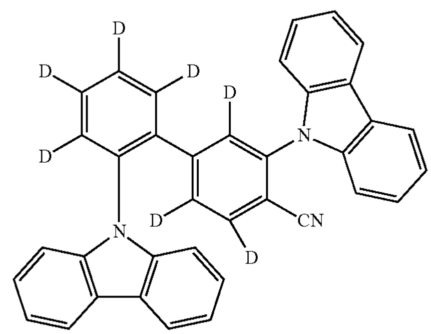
104
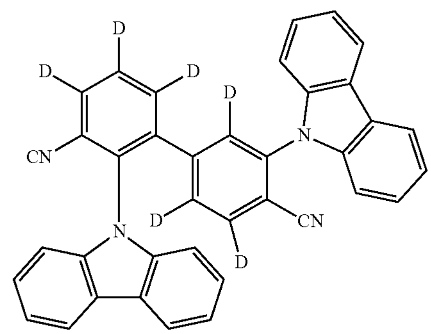
105
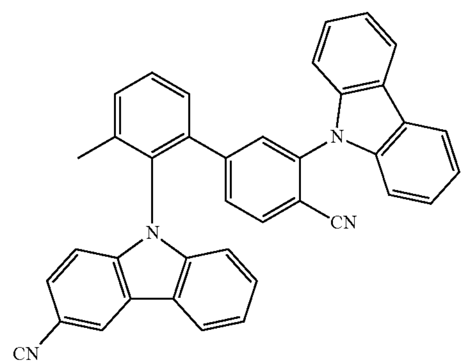
106
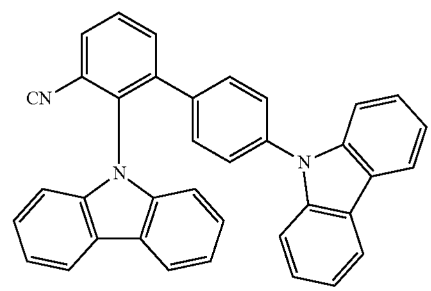

-continued
107
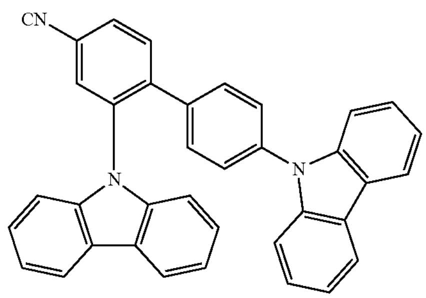
108
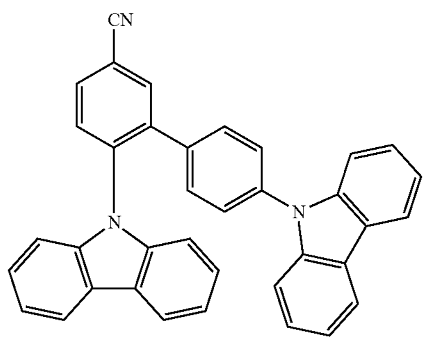
109
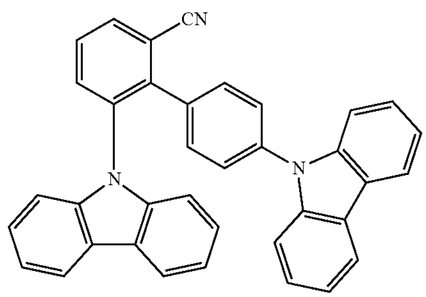
110
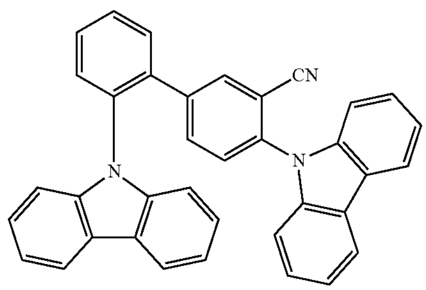
111
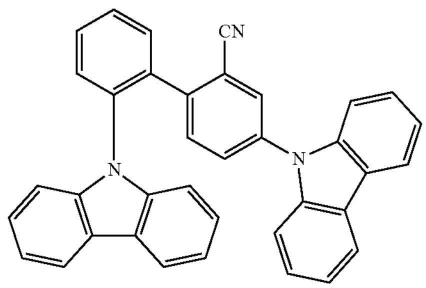
-continued
112
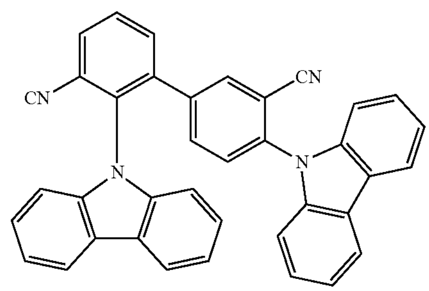
113
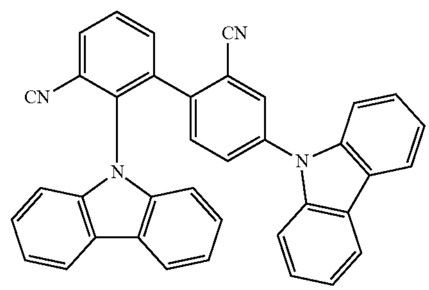
114
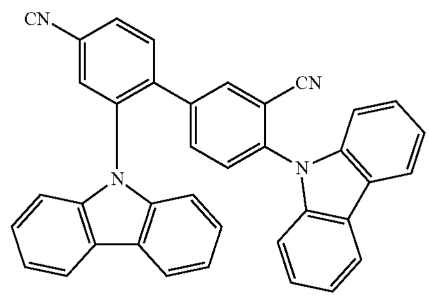
115
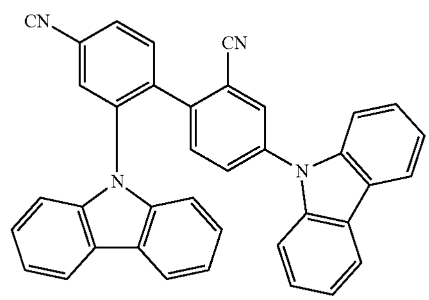
116
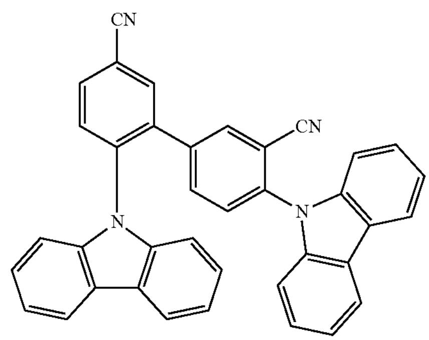

-continued
117
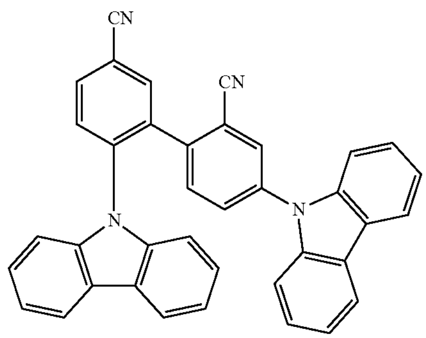
118
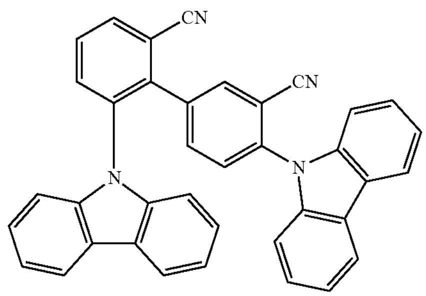
119
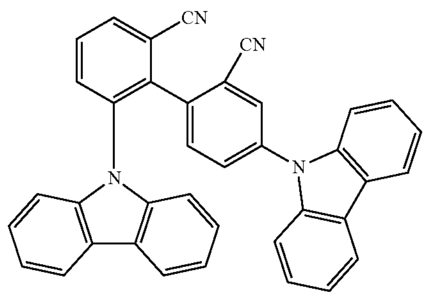
120
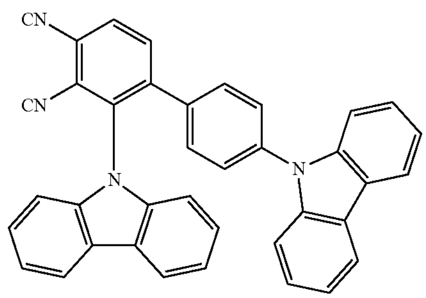
121
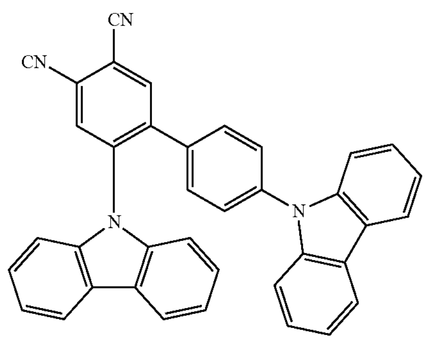
-continued
122
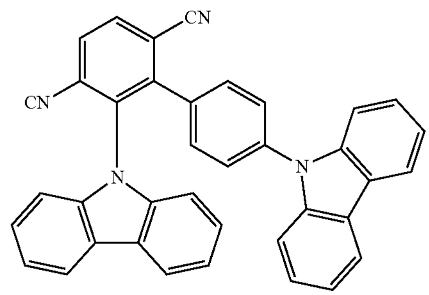
123
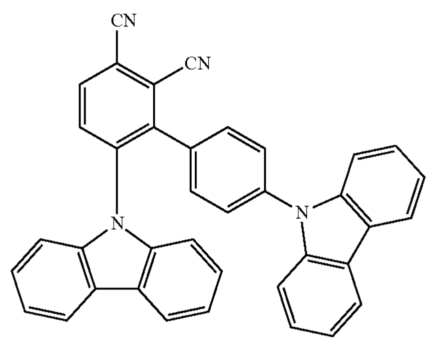
124
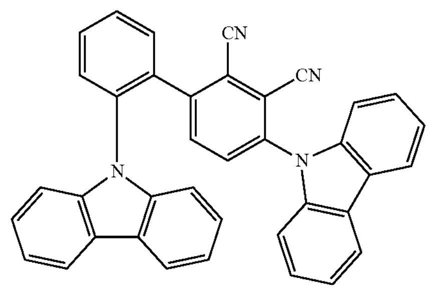
125
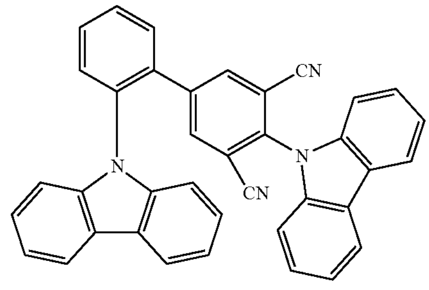
126
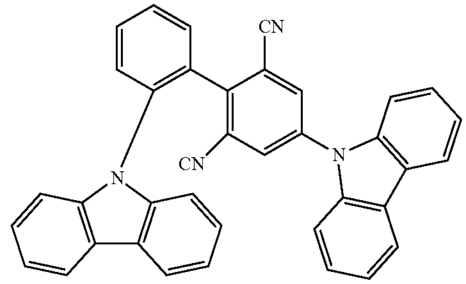

-continued
127
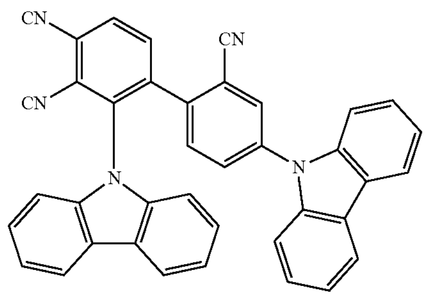
128
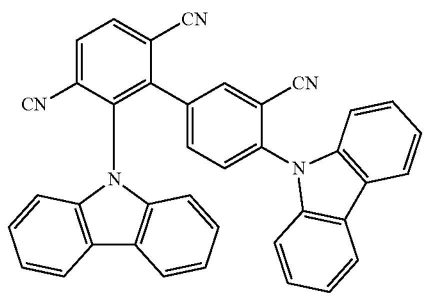
129
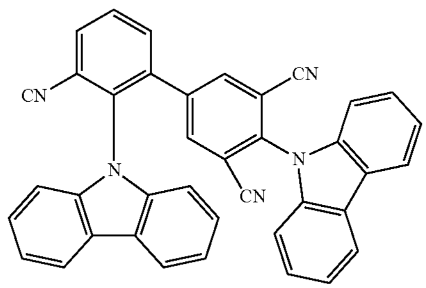
130
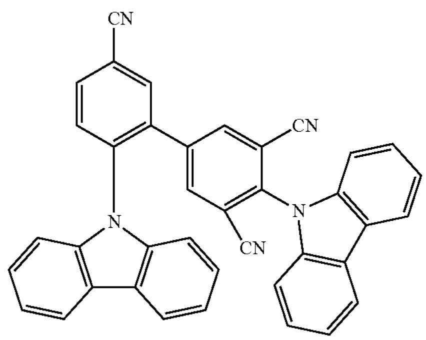
131
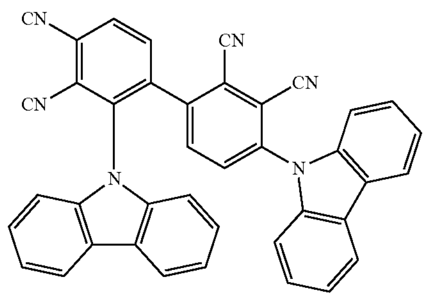
-continued
132
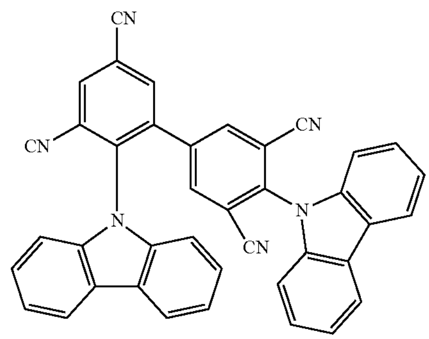
133
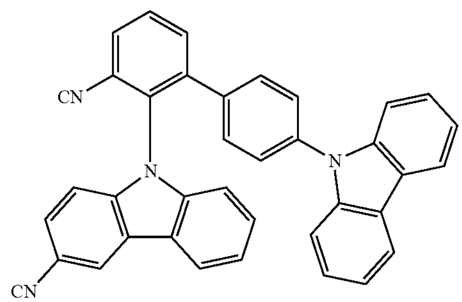
134
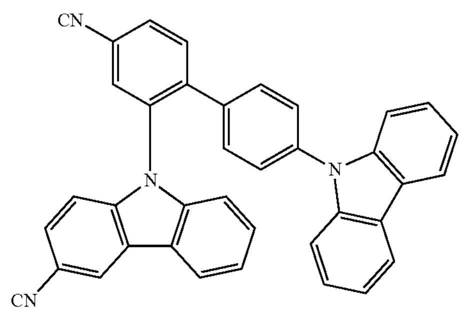
135
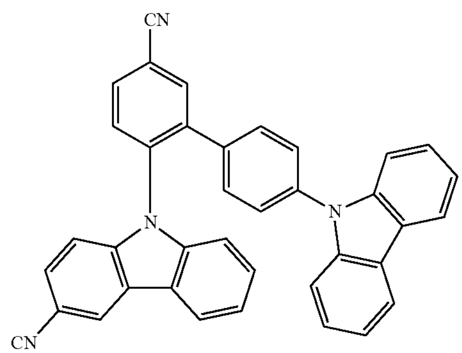
136
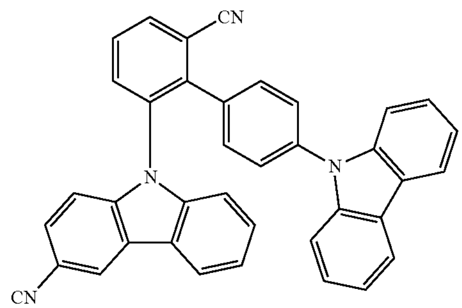

-continued
137
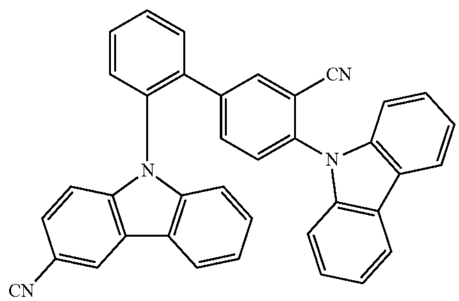
138
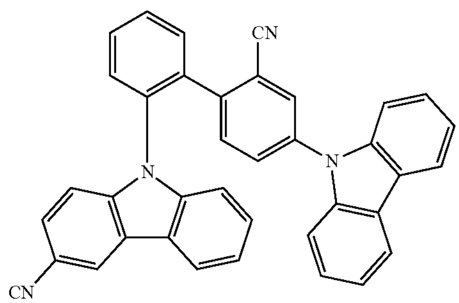
139
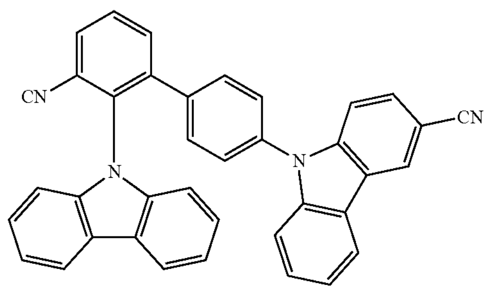
140
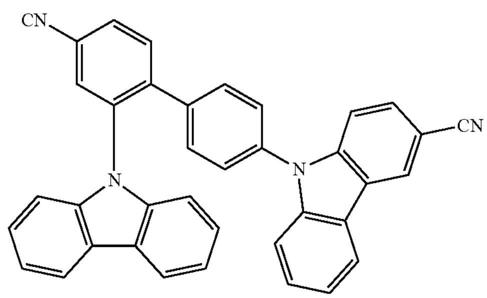
141
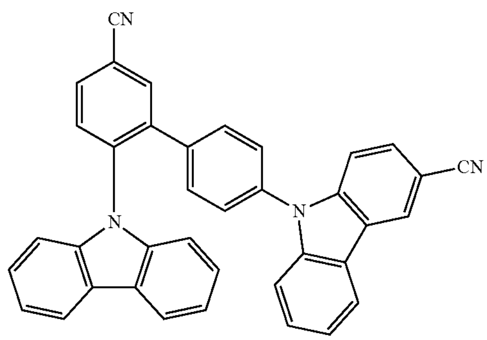
-continued
142
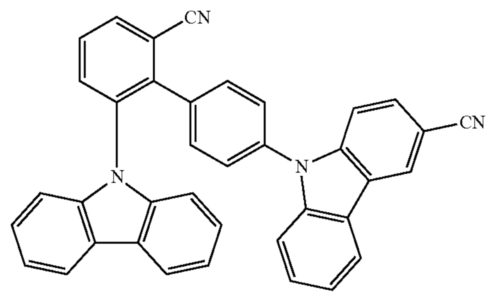
143
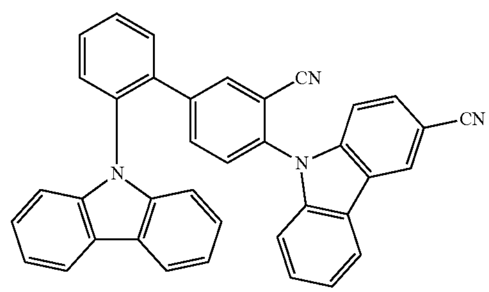
144
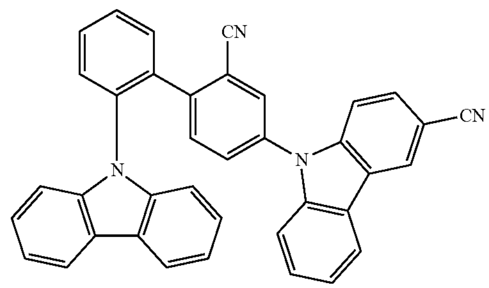
145
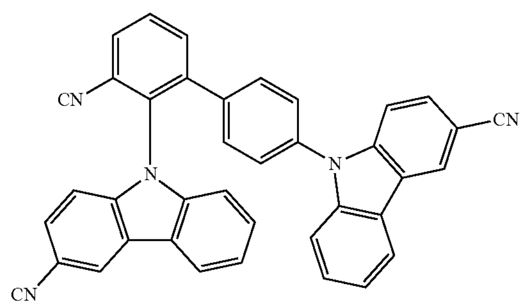
146
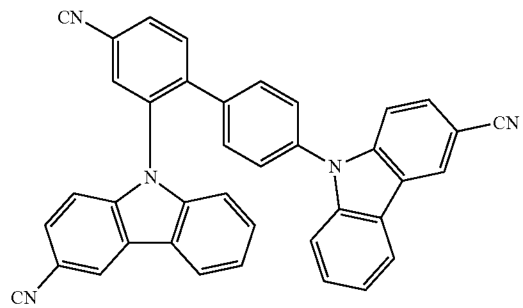

-continued
147
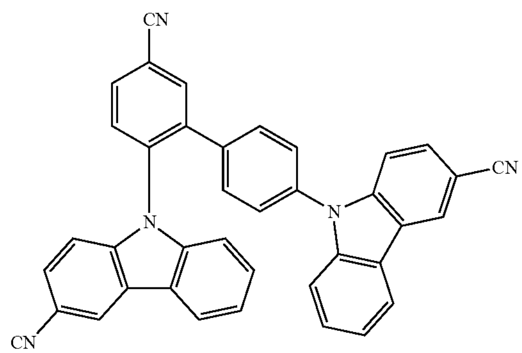
148
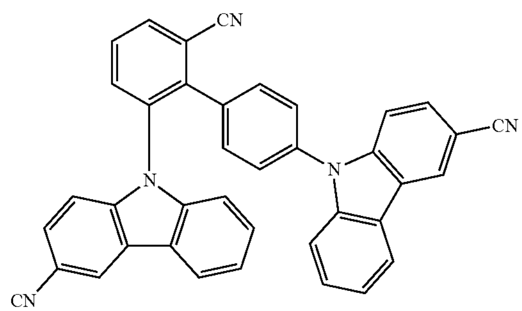
149
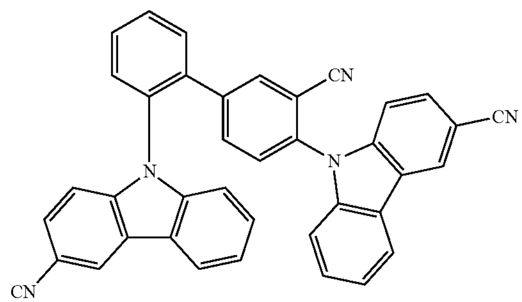
150
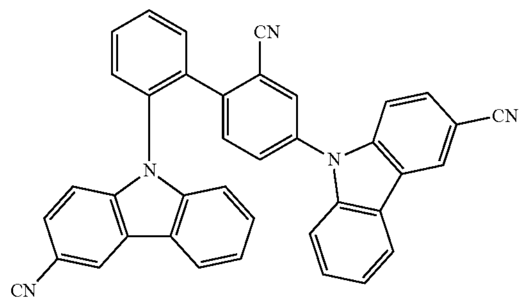
-continued
151
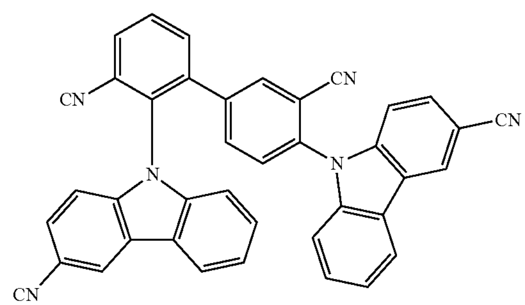
152
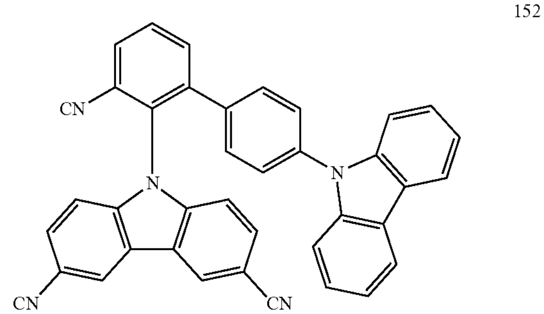
153
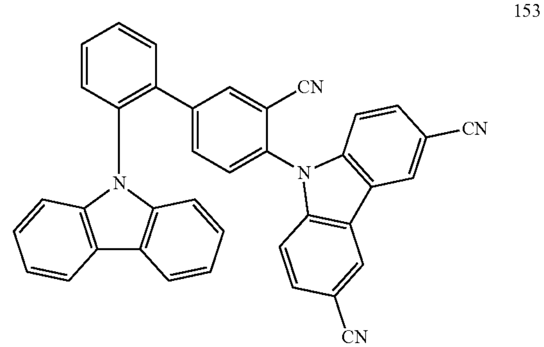
154
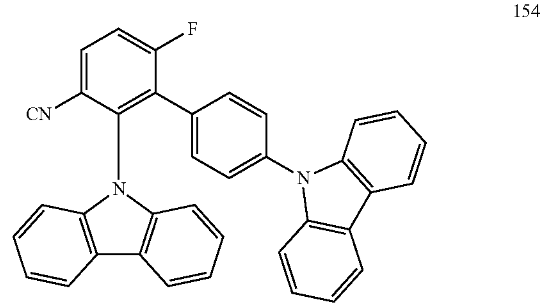
155
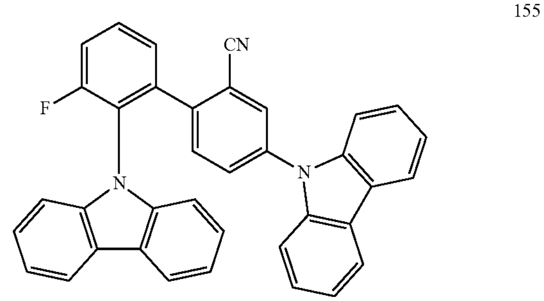

-continued
156
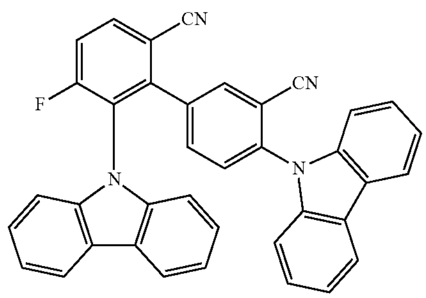
157
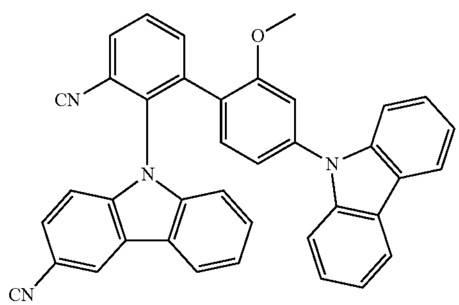
158
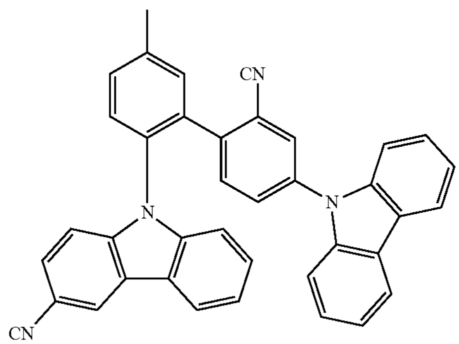
159
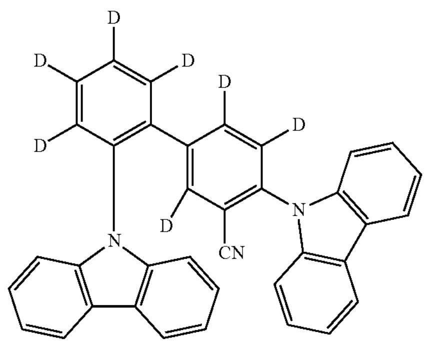
160
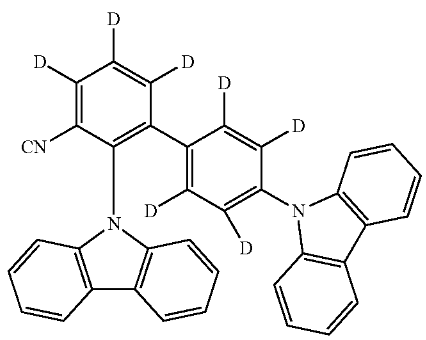
-continued
161
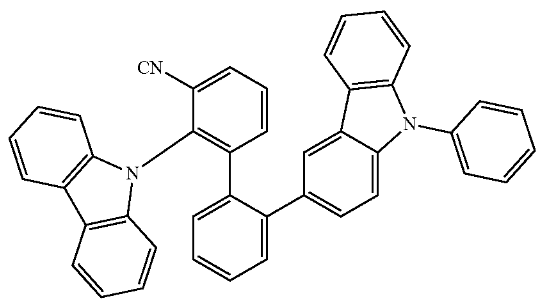
162
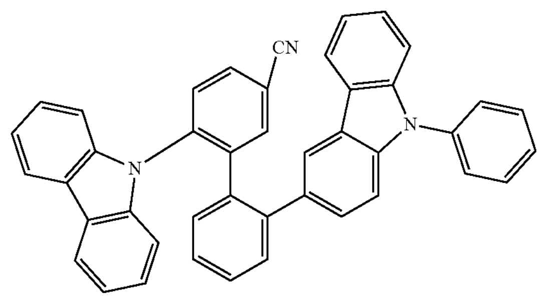
163
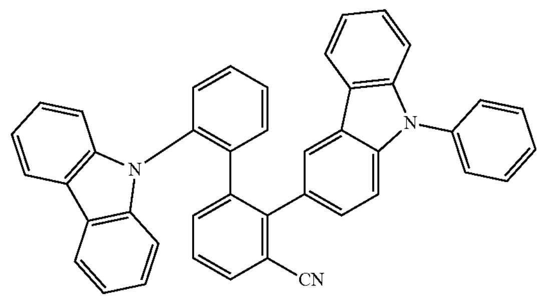
164
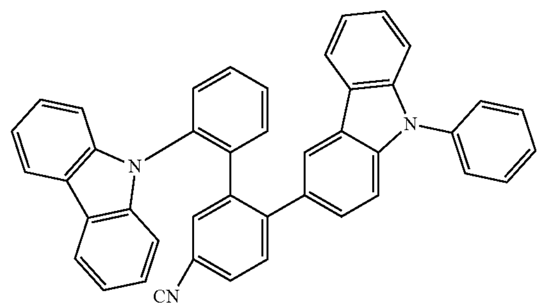
165
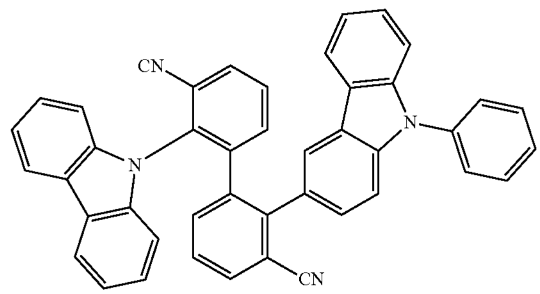

-continued
166
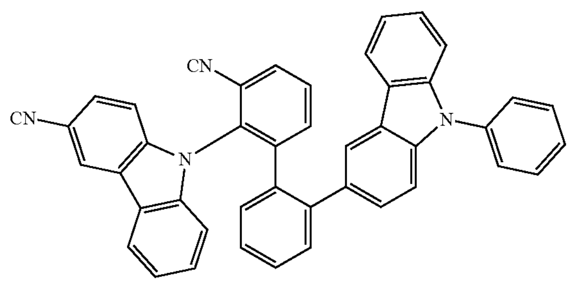
167
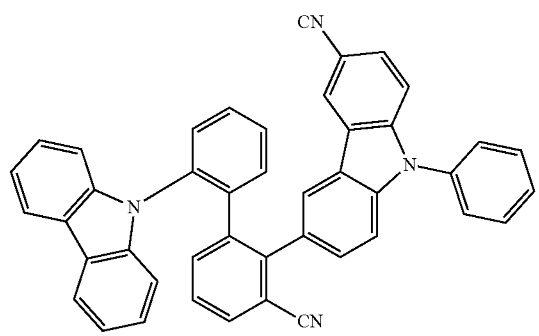
168
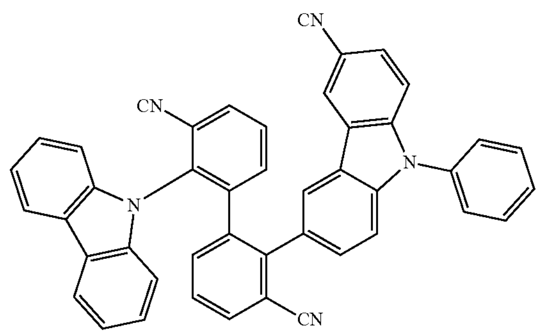
169
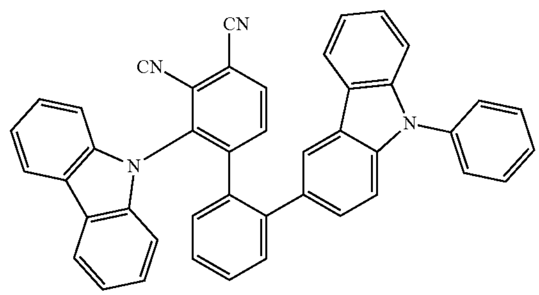
170
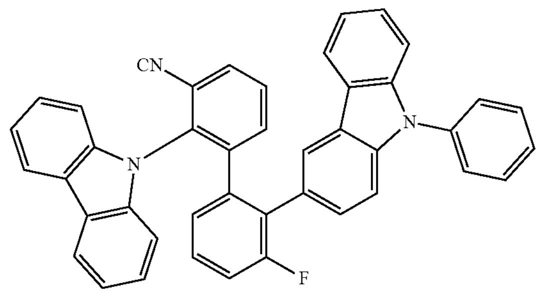
-continued
171
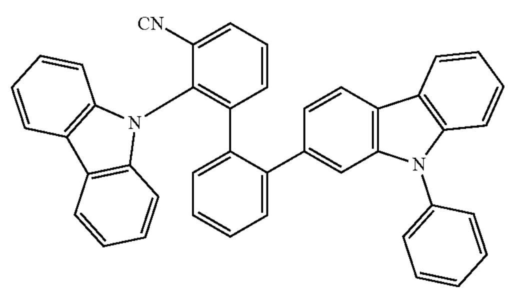
172
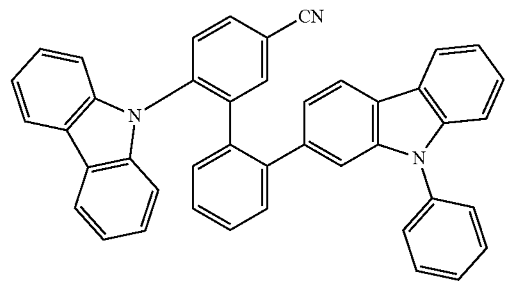
173
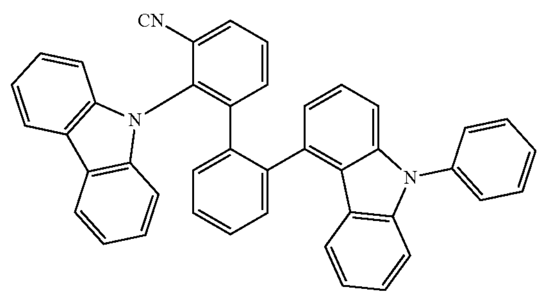
174
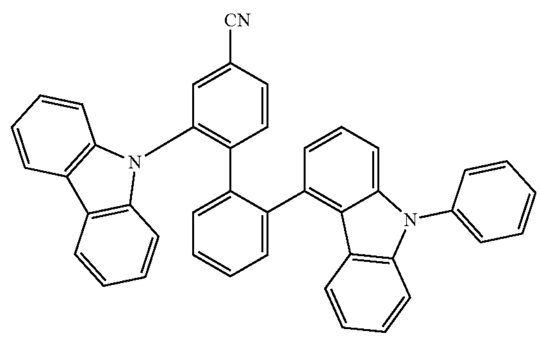
175
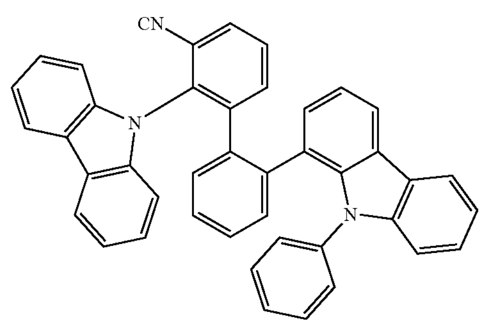

-continued
176
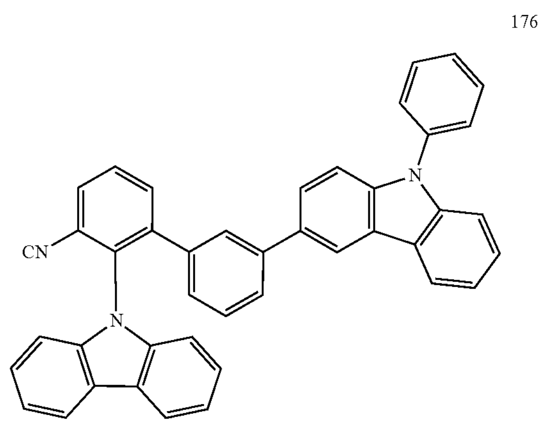
177
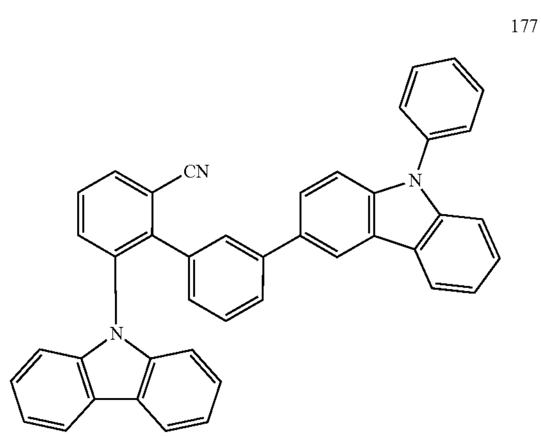
178
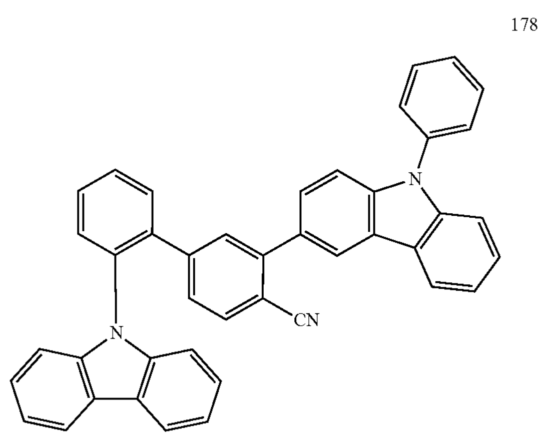
179
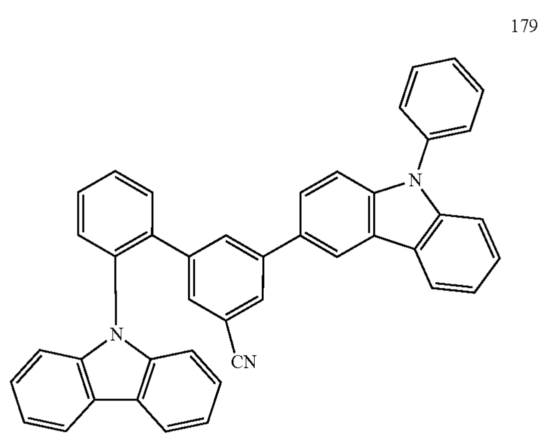
-continued
180
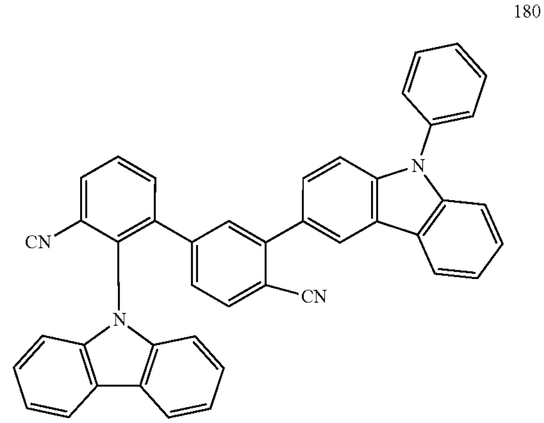
181
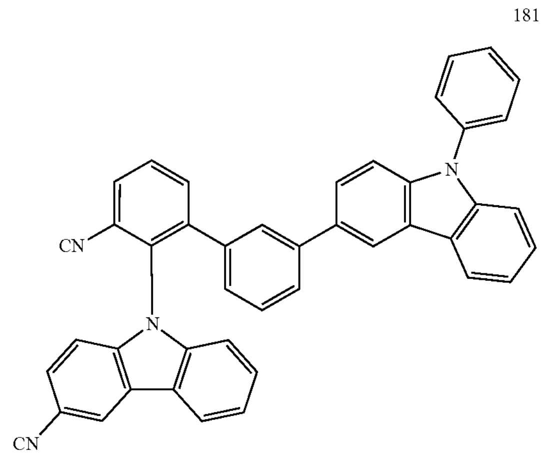
182
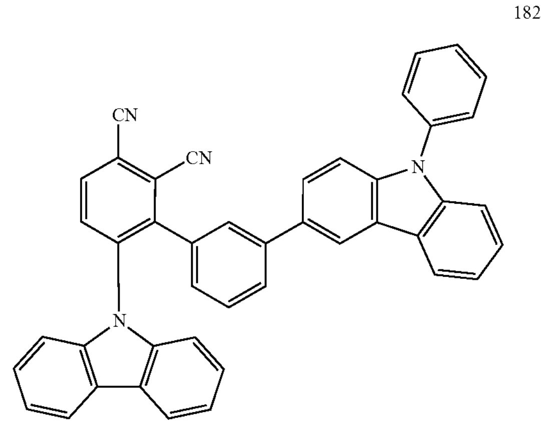
183
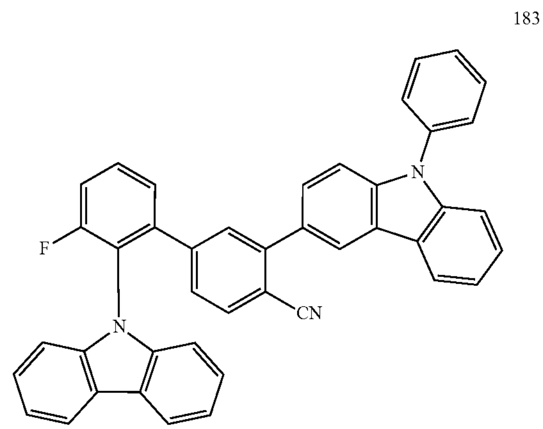

184
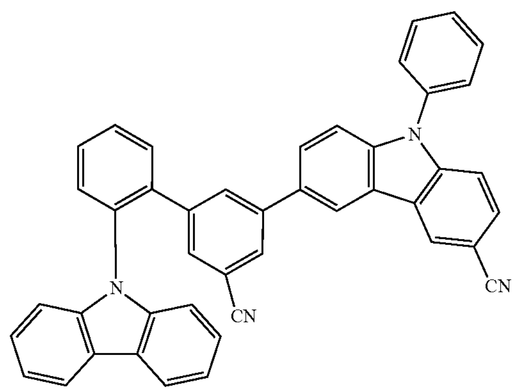
185
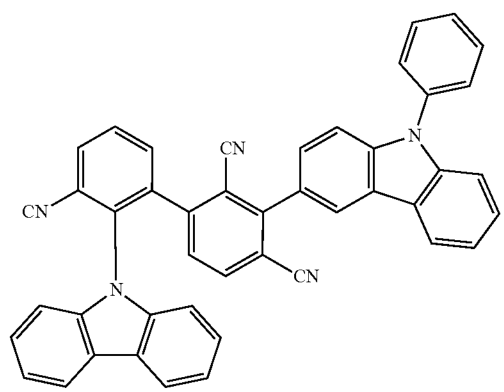
186
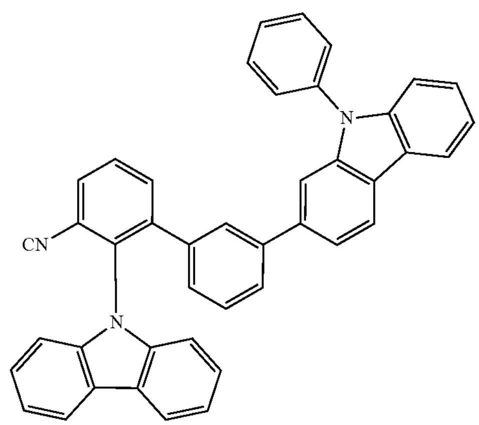
187
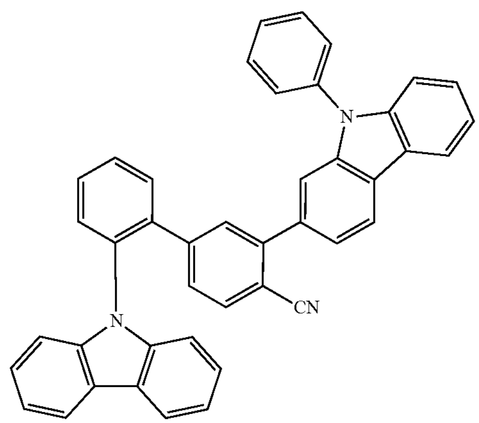
188
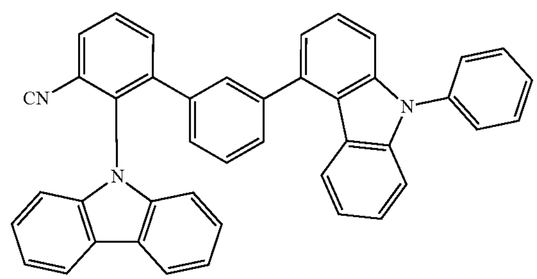
189
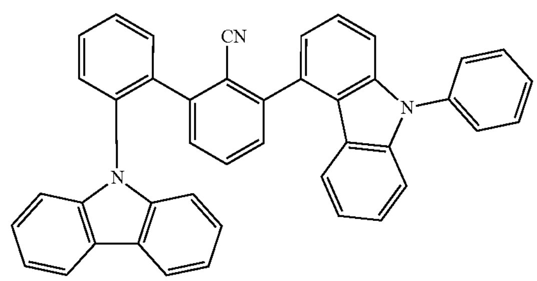
190
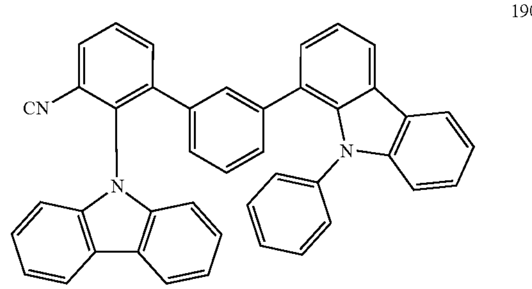
191
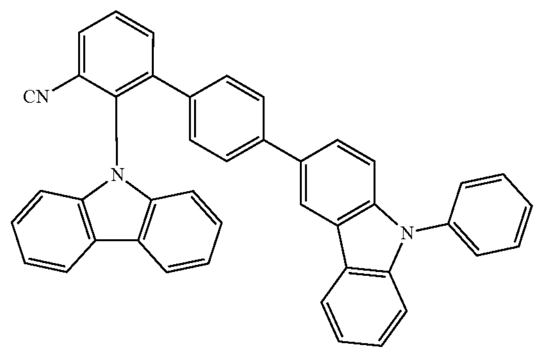
192
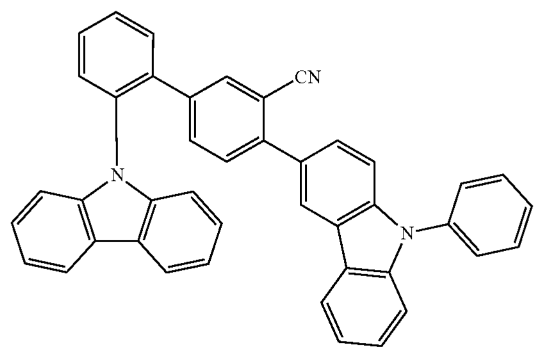

-continued
193
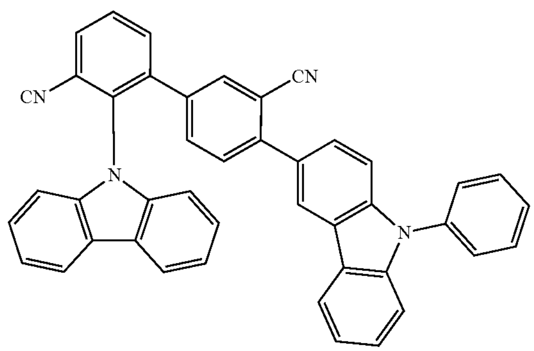
194
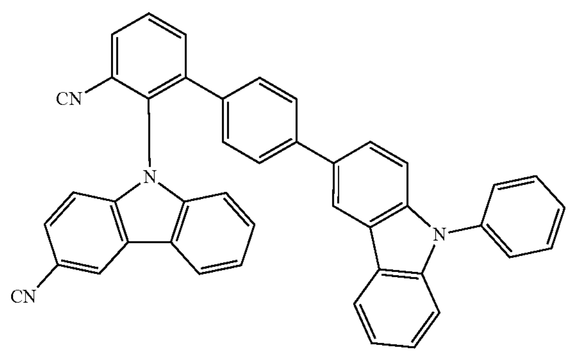
195
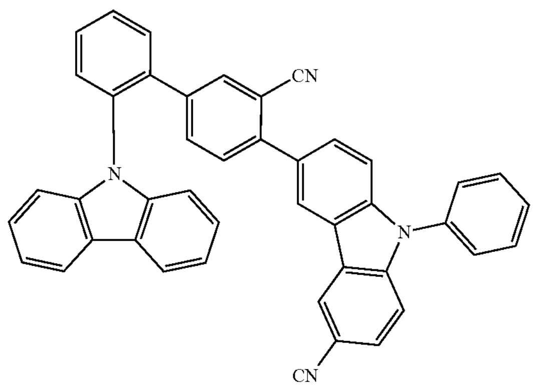
196
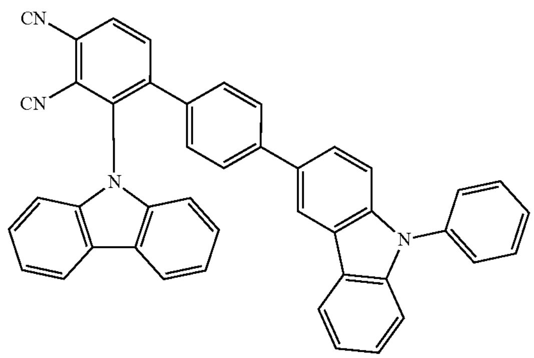
-continued
197
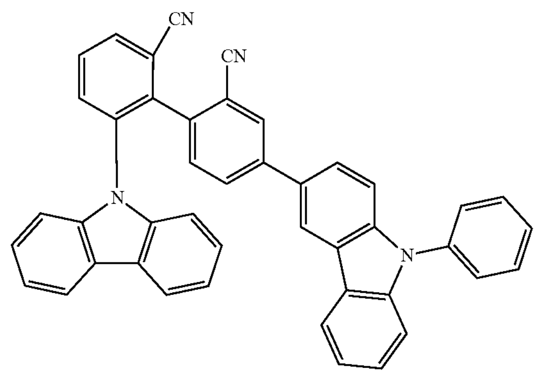
198
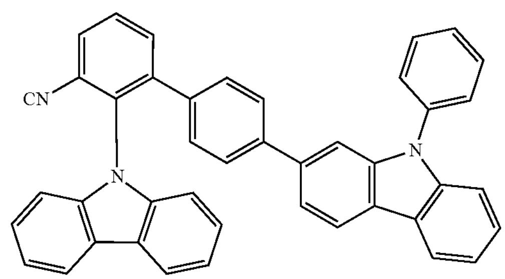
199
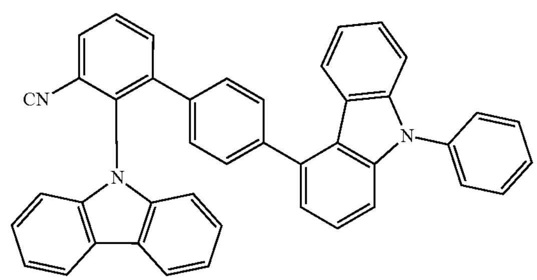
200
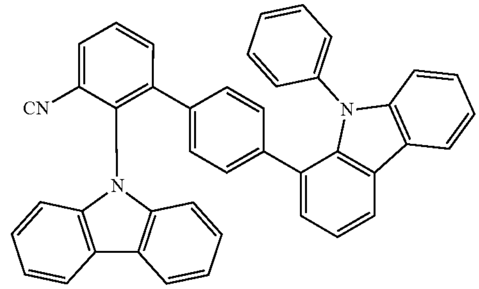
201
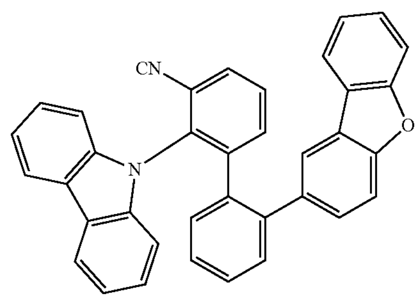

-continued
202
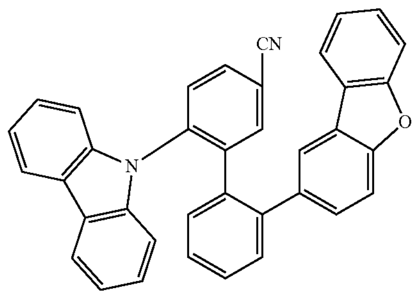
203
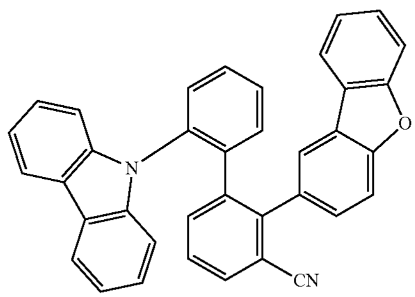
204
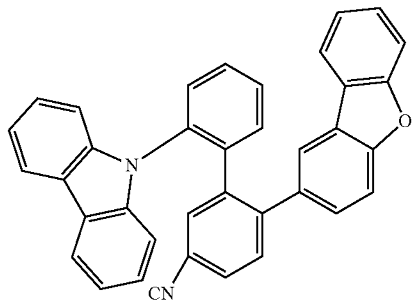
205
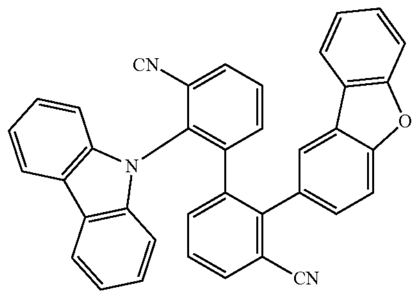
206
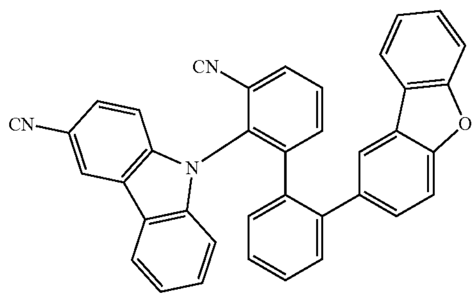
-continued
207
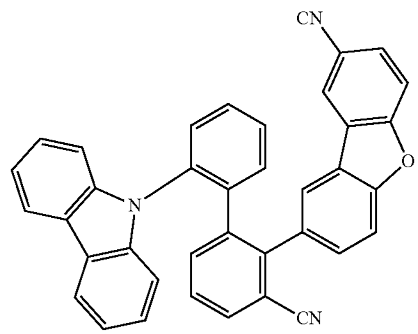
208
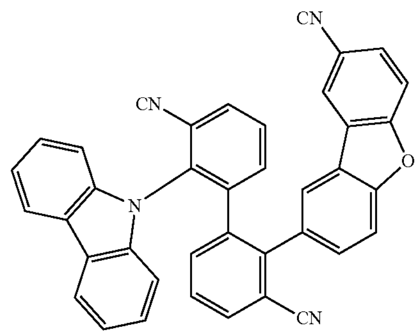
209
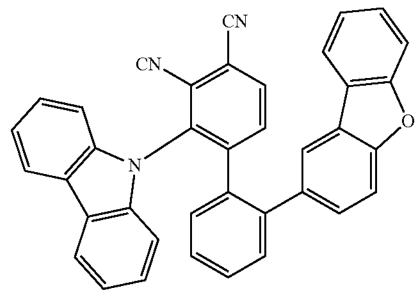
210
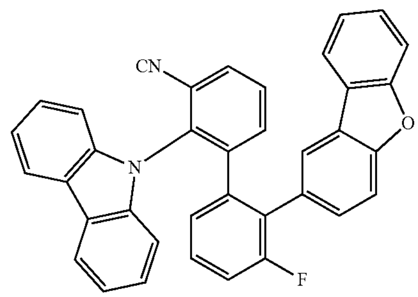
211
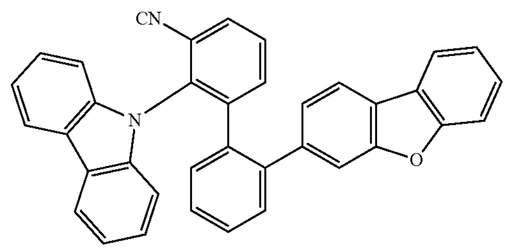

-continued
212
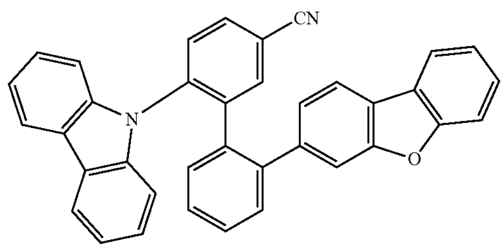
213
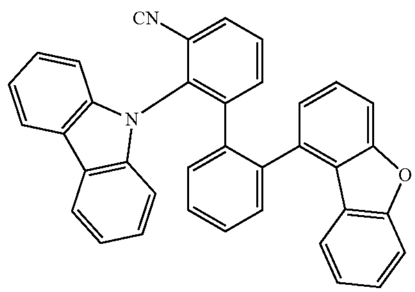
214
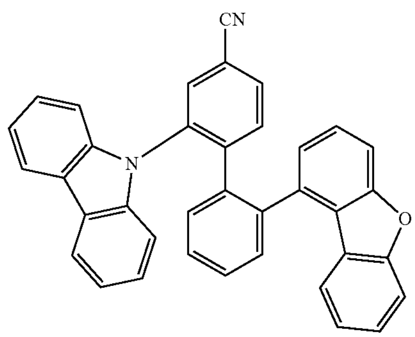
215
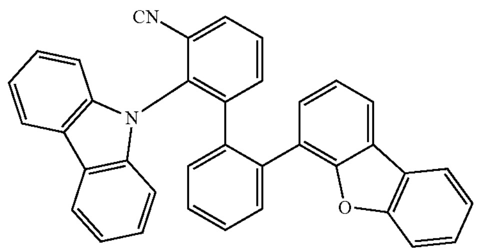
216
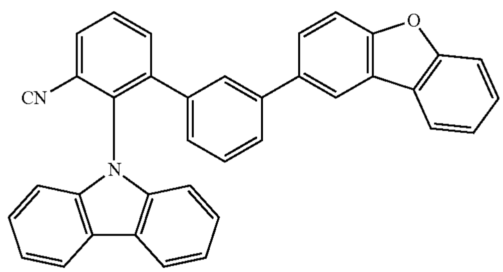
-continued
217
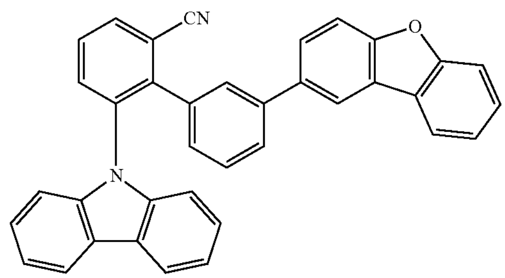
218
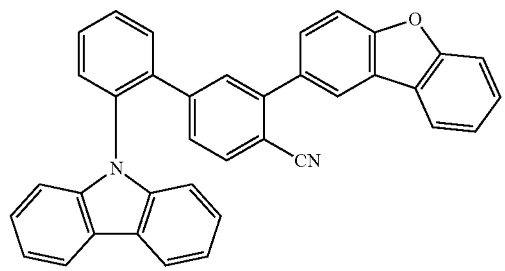
219
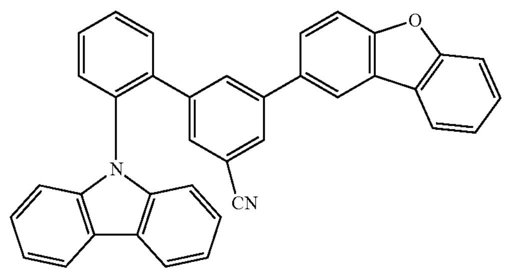
220
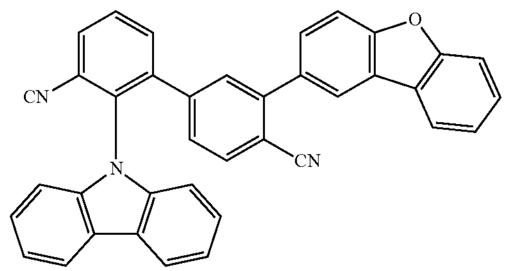
221
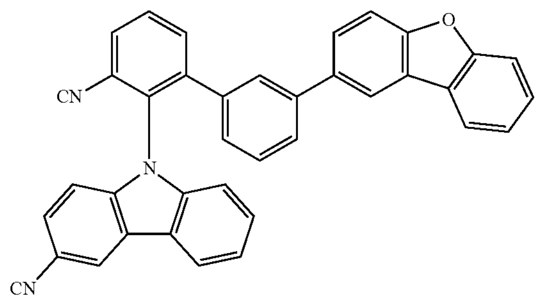

-continued
222
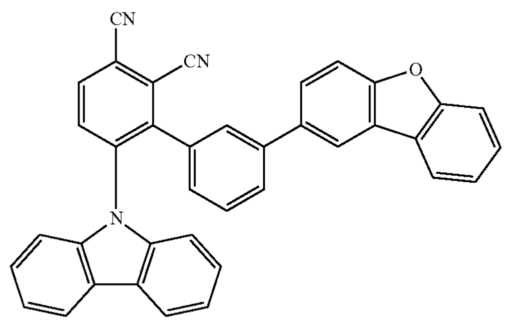
223
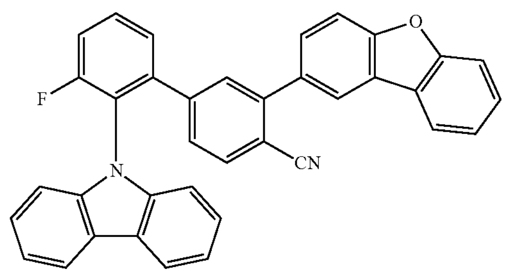
224
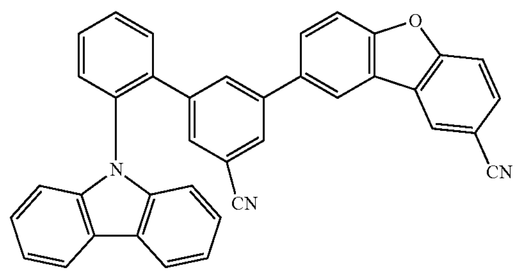
225
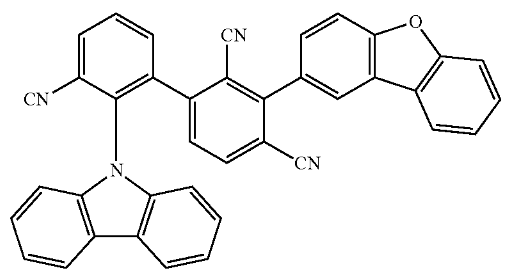
226
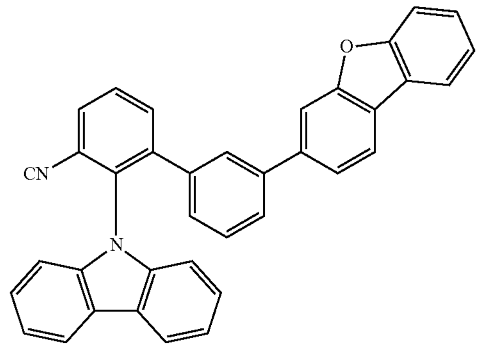
-continued
227
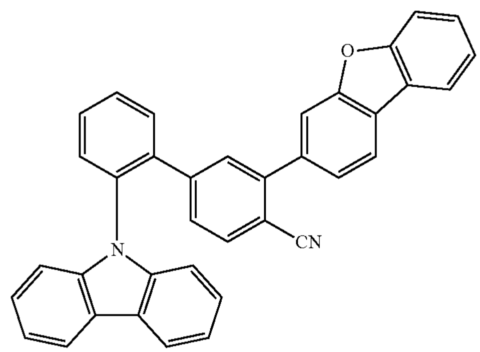
228
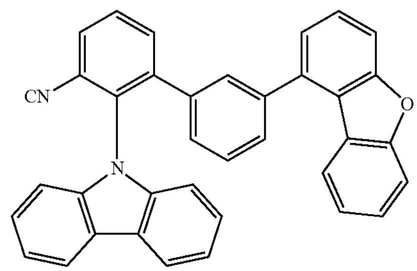
229
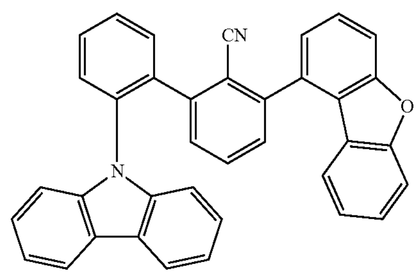
230
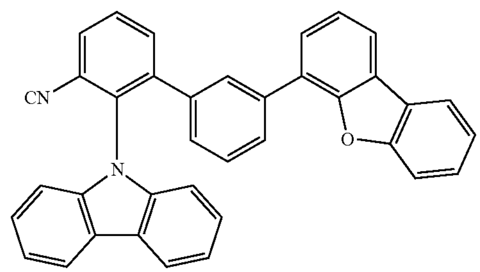
231
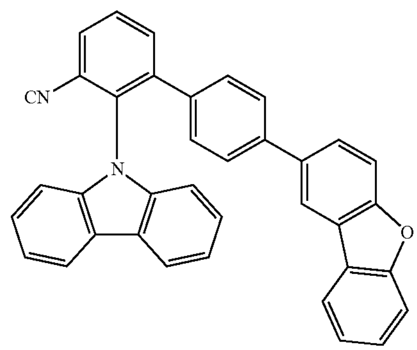

-continued
232
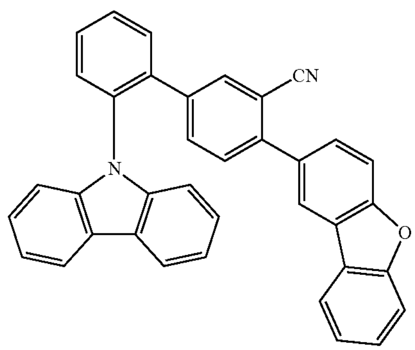
233
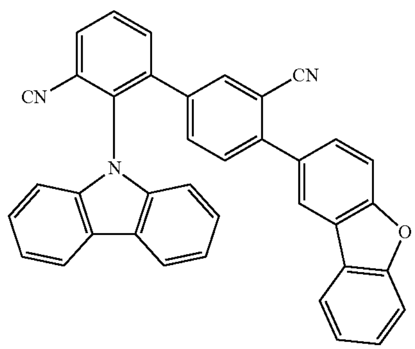
234
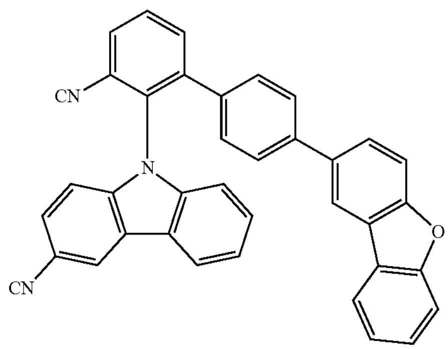
235
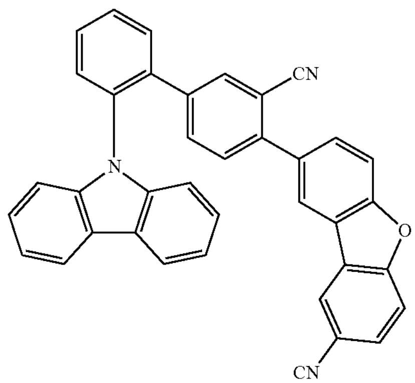
-continued
236
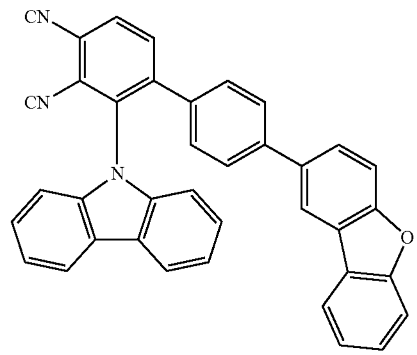
237
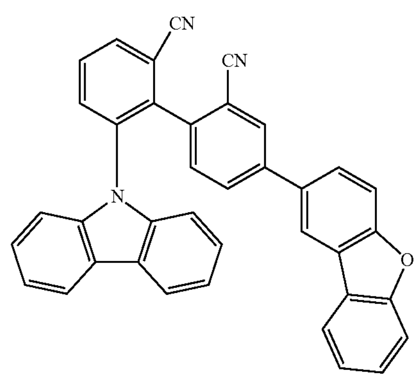
238
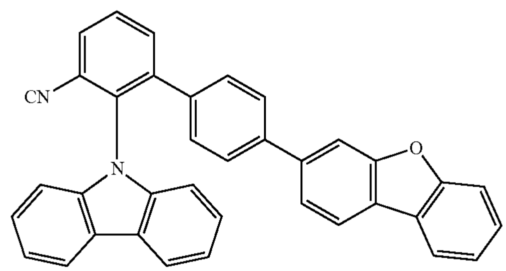
239
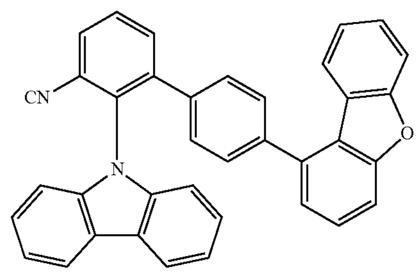
240
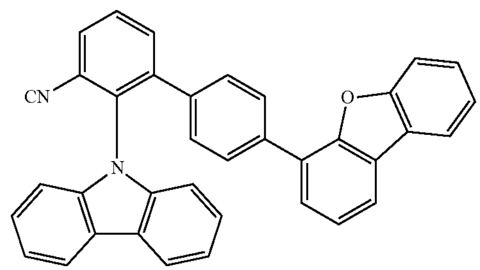

-continued
241
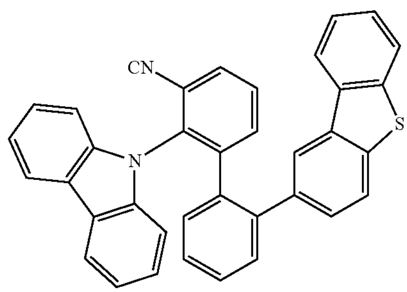
242
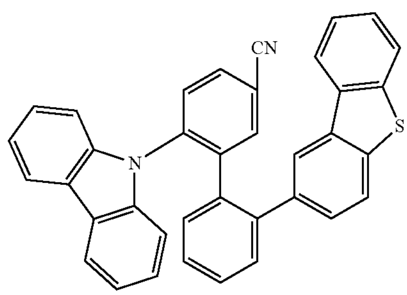
243
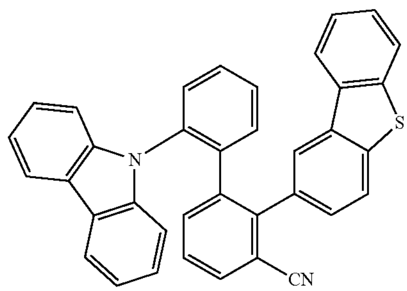
244
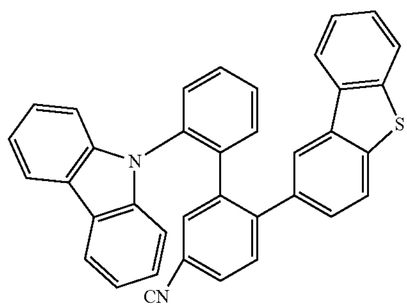
245
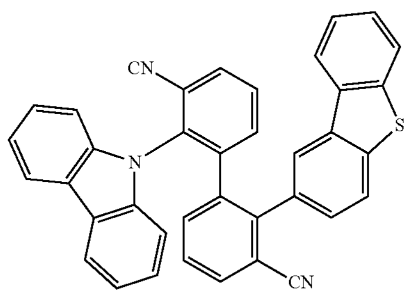
246
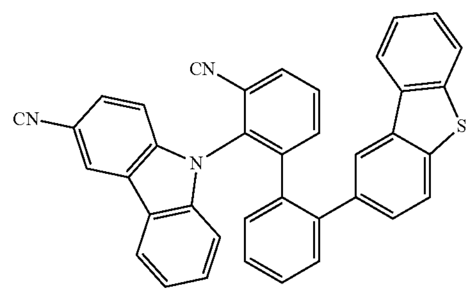
247
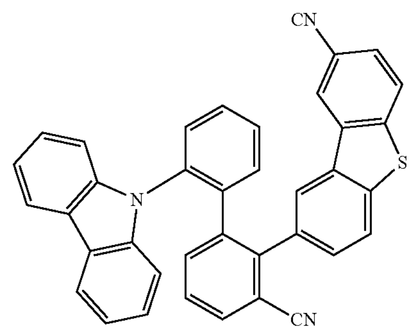
248
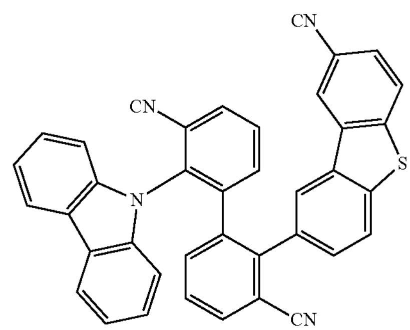
249
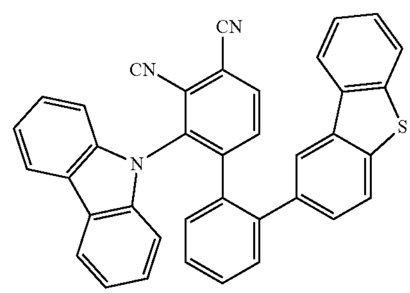
250
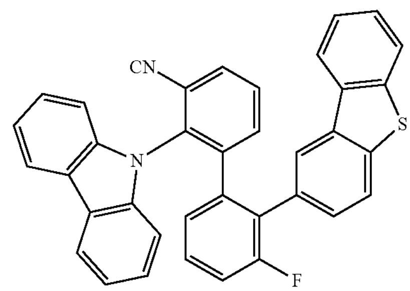

-continued
251
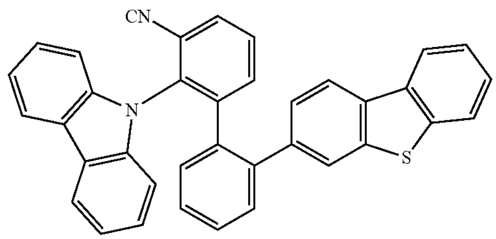
252
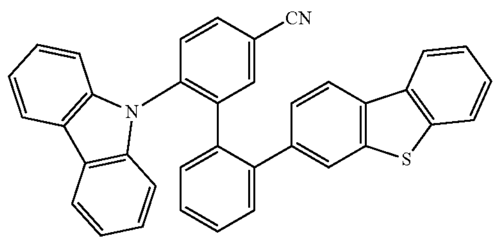
253
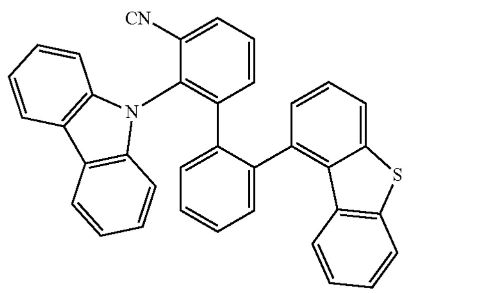
254
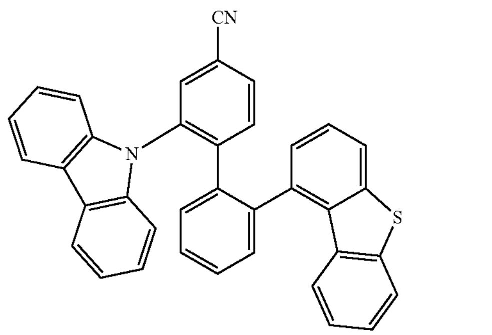
255
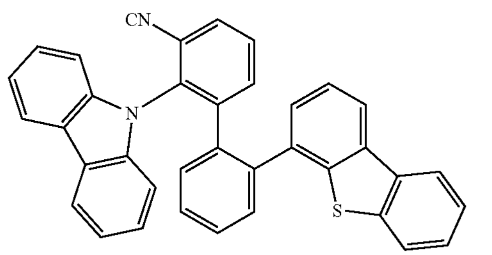
-continued
256
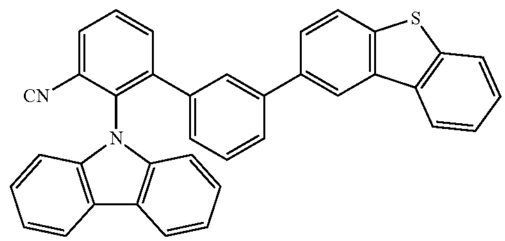
257
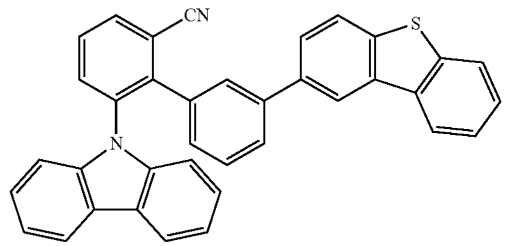
258
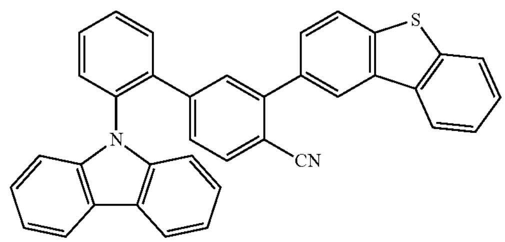
259
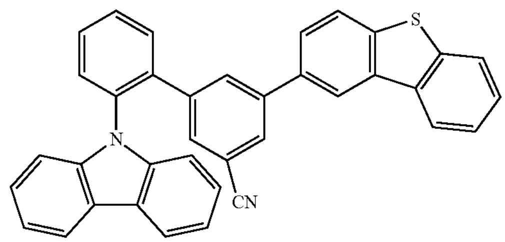
260
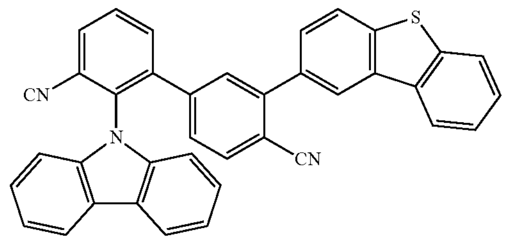
261
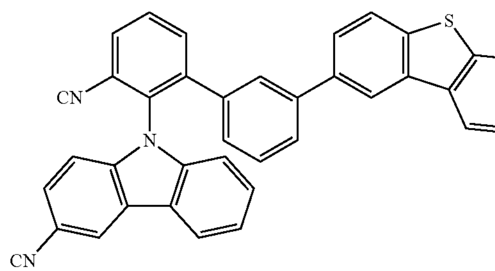

-continued
262
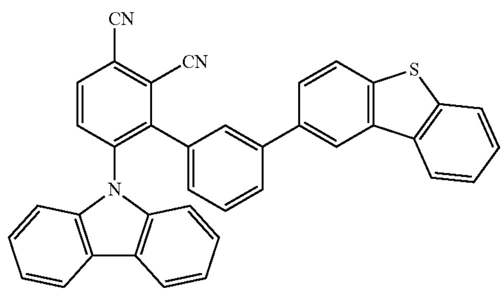
263
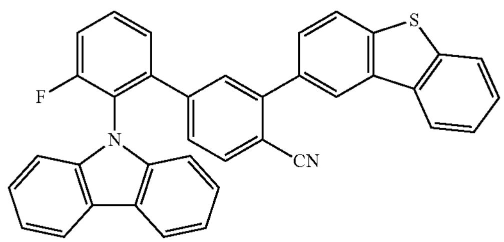
264
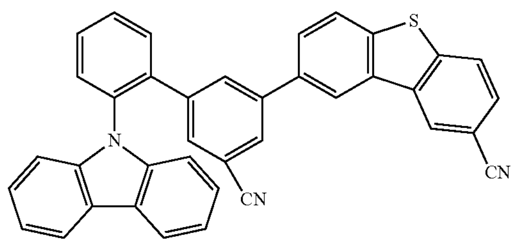
265
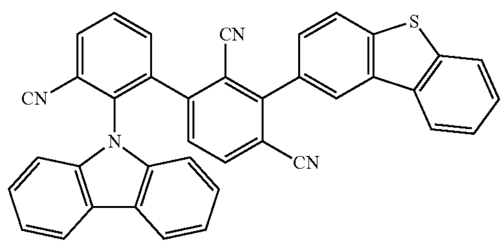
266
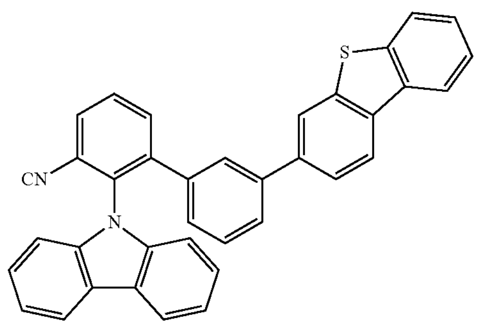
-continued
267
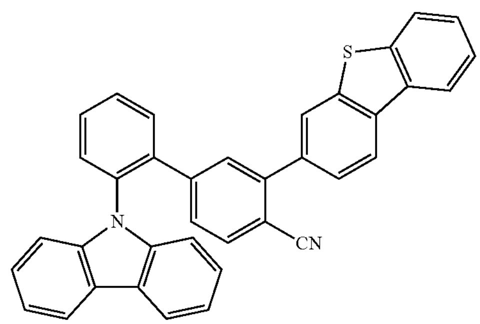
268
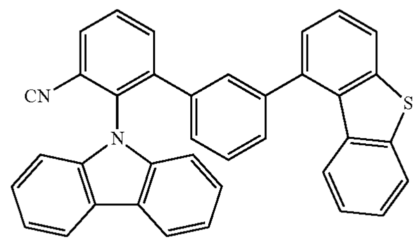
269
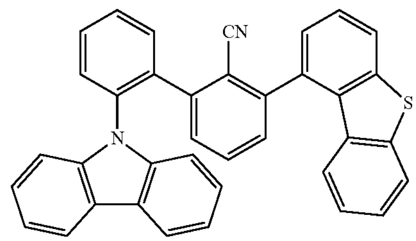
270
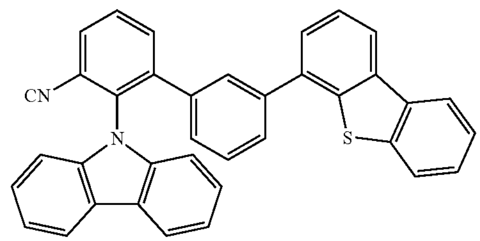
271
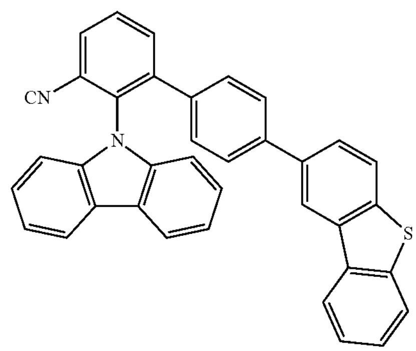

-continued
272
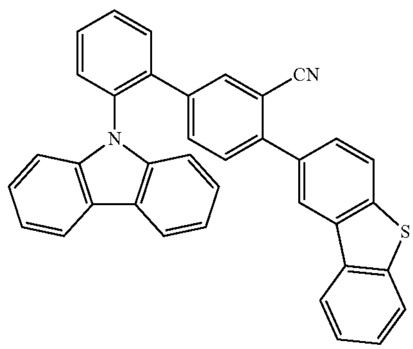
273
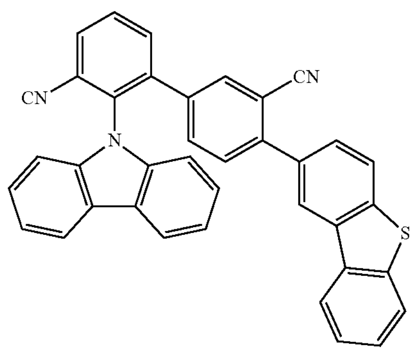
274
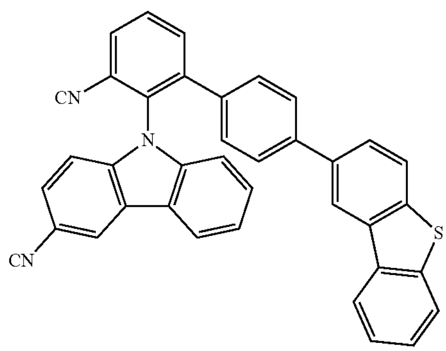
275
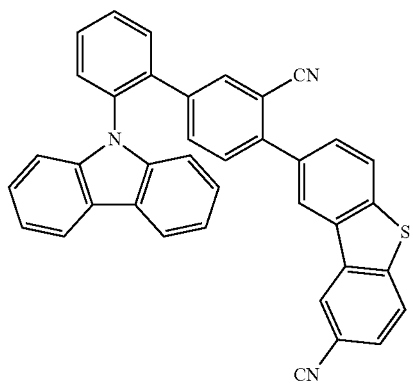
-continued
276
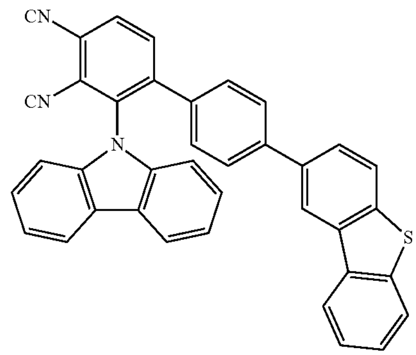
277
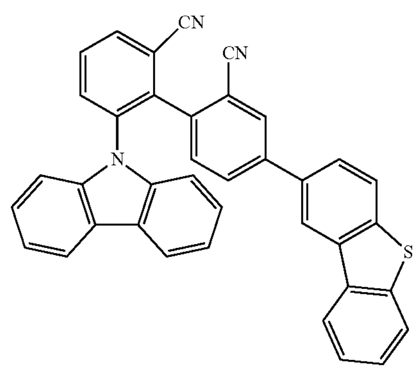
278
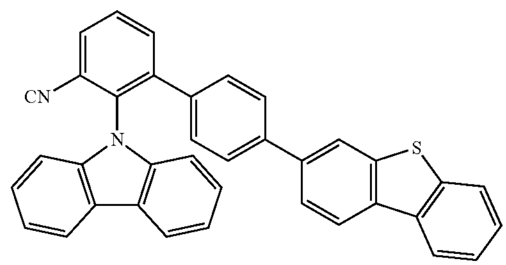
279
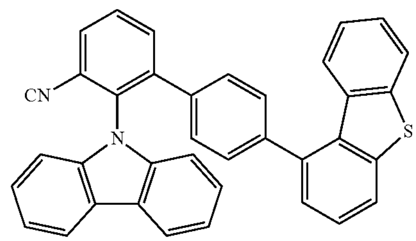
280
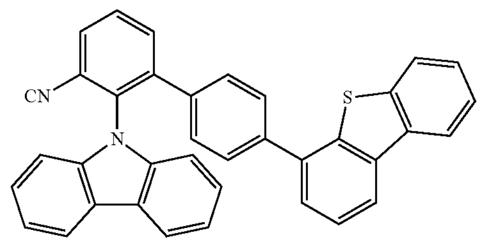

-continued
281
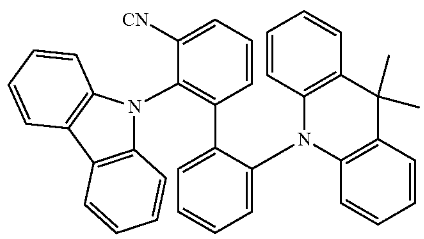
282
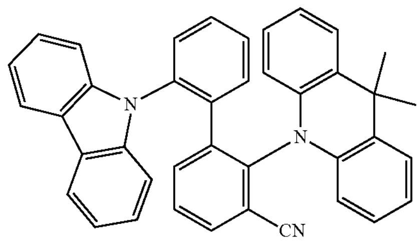
283
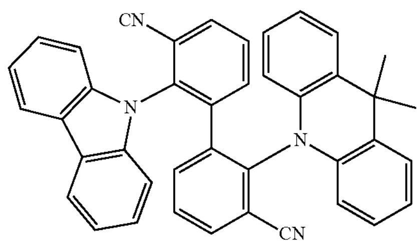
284
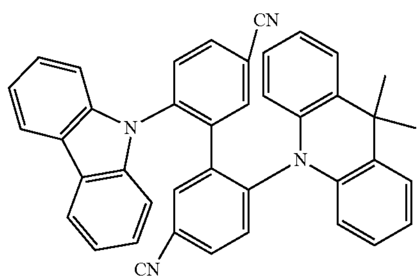
285
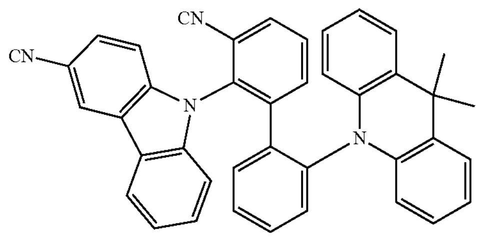
286
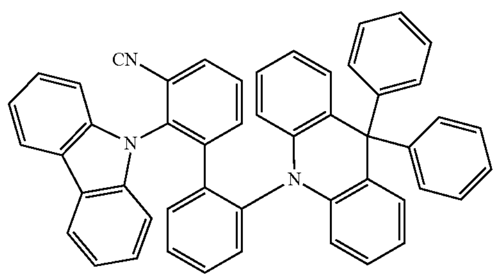
-continued
287
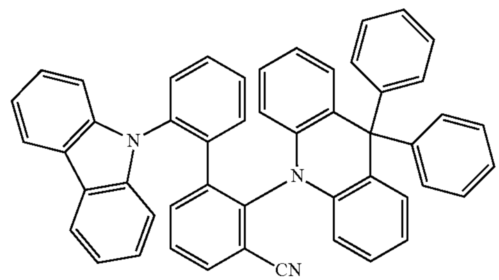
288
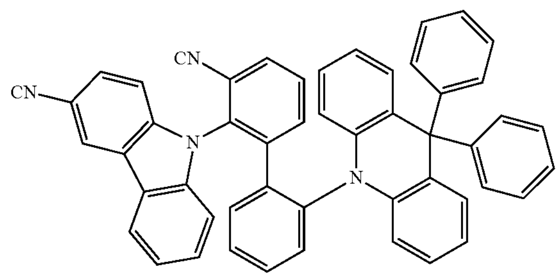
289
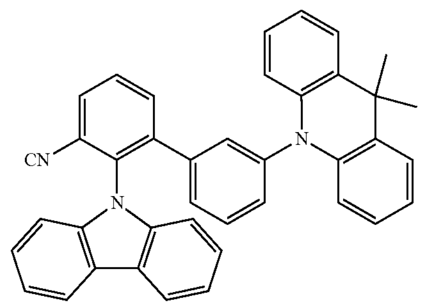
290
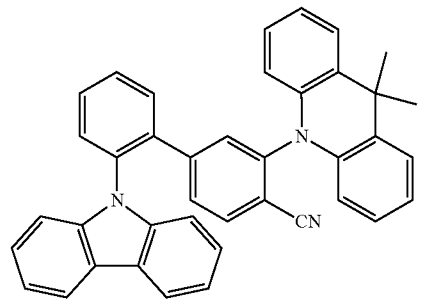
291
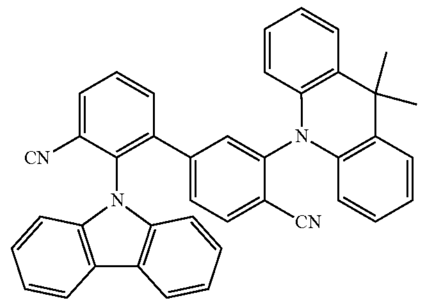

-continued
292
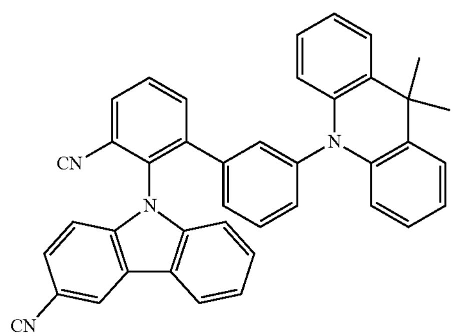
293
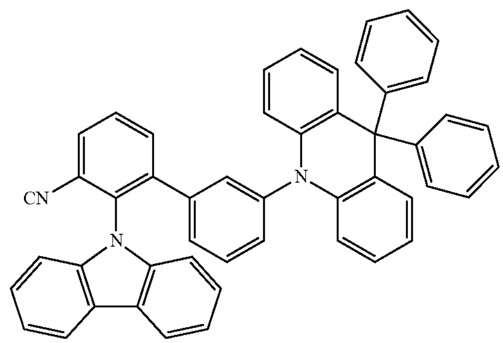
294
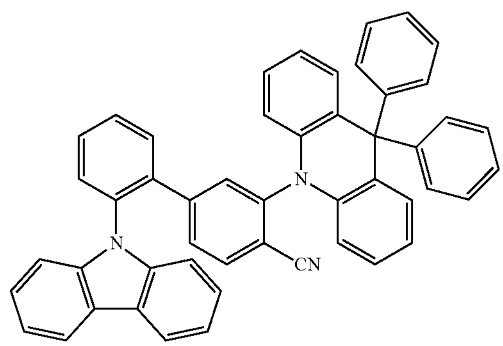
295
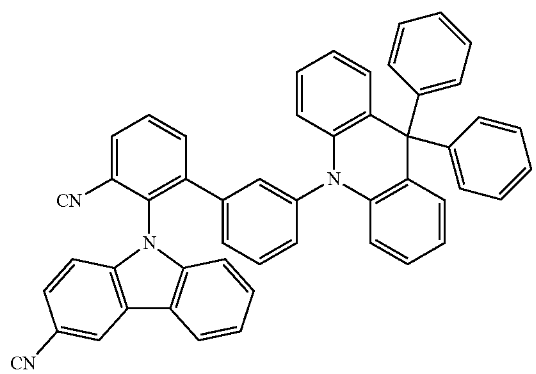
-continued
296
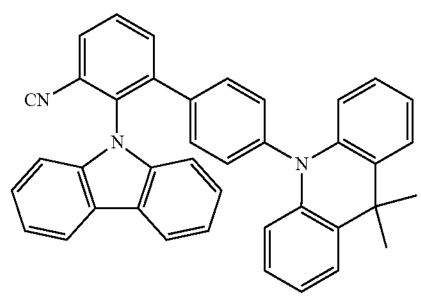
297
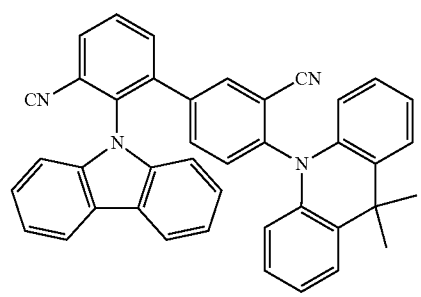
298
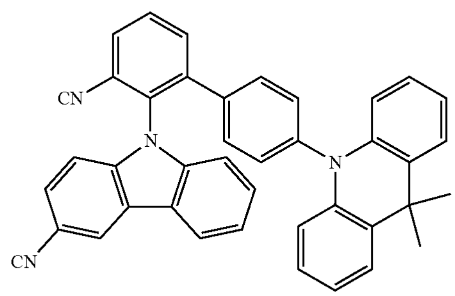
299
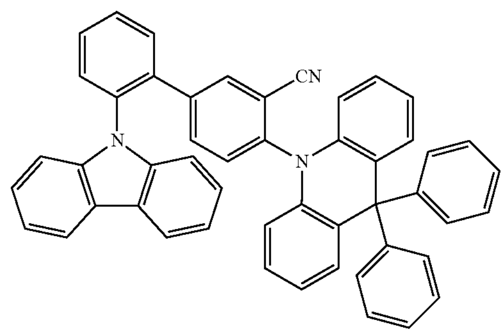
300
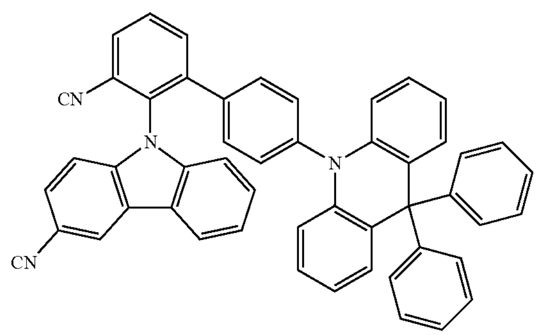

-continued
301
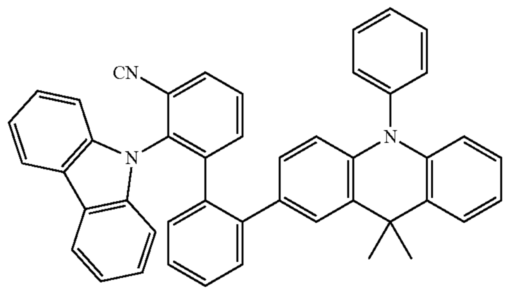
302
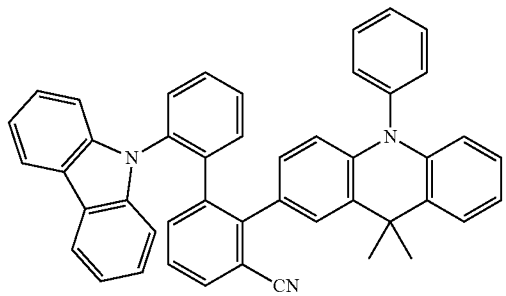
303
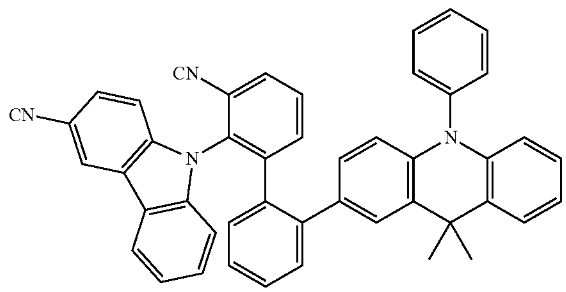
304
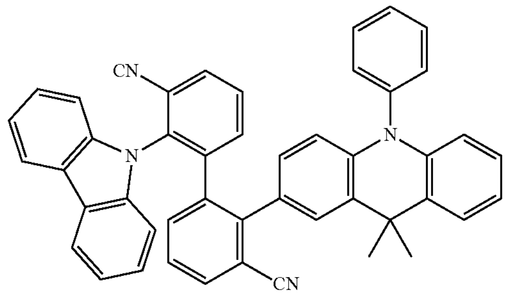
305
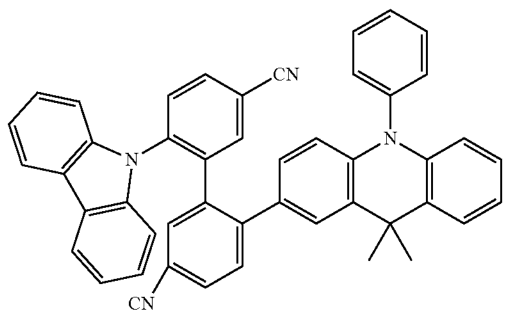
-continued
306
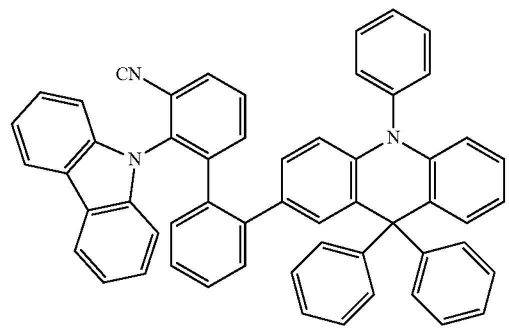
307
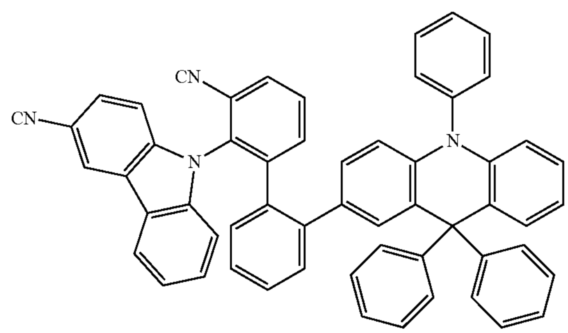
308
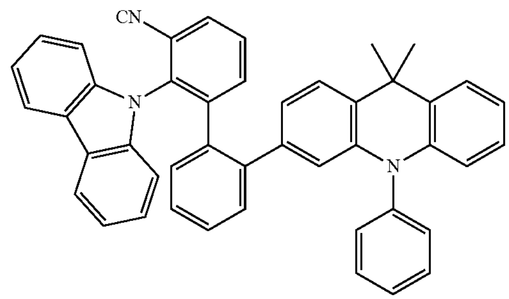
309
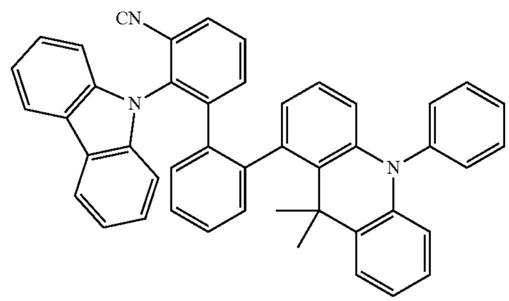

-continued
310
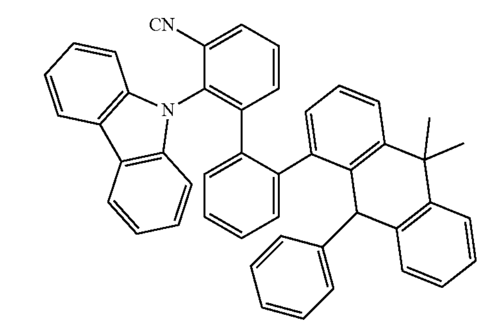
311
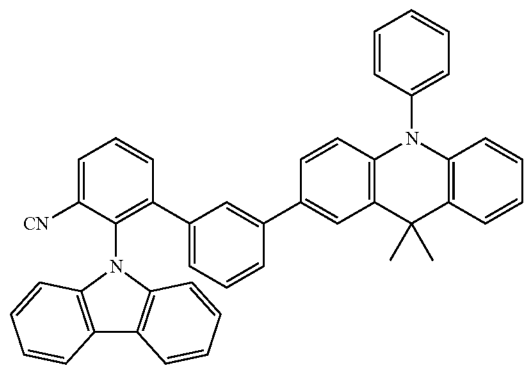
312
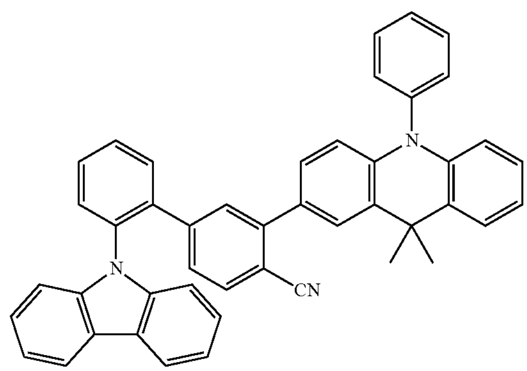
313
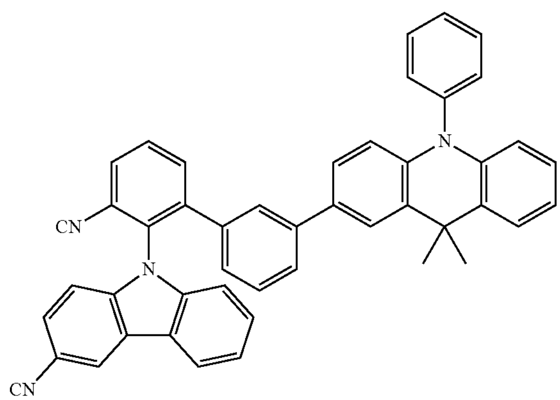
-continued
314
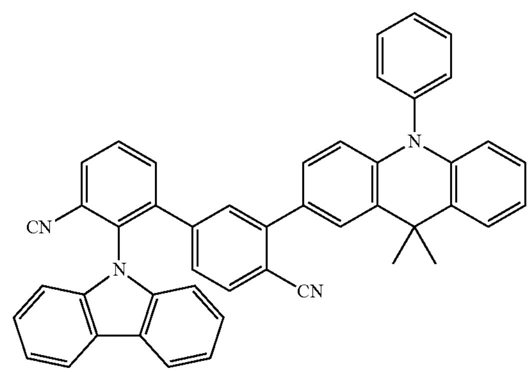
315
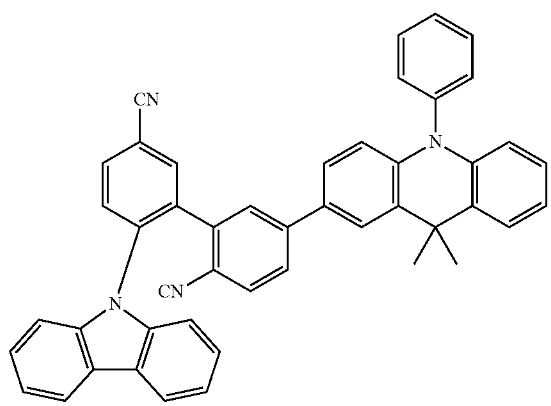
316
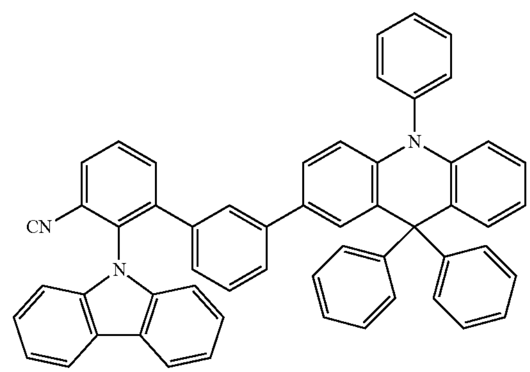
317
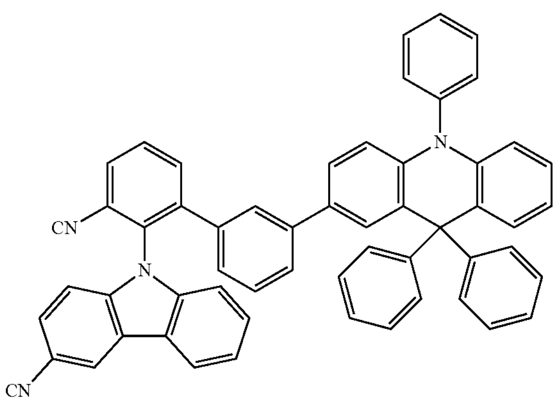

-continued
318
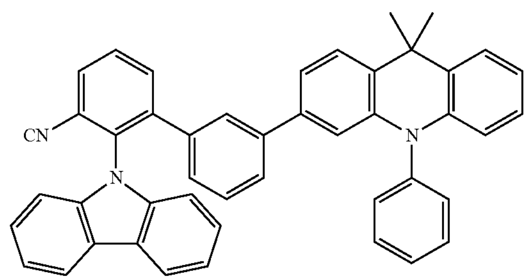
319
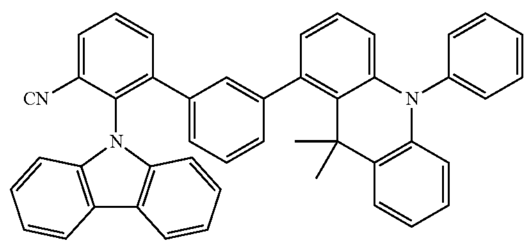
320
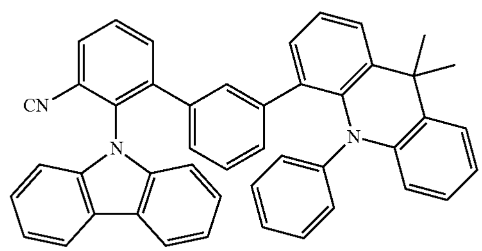
321
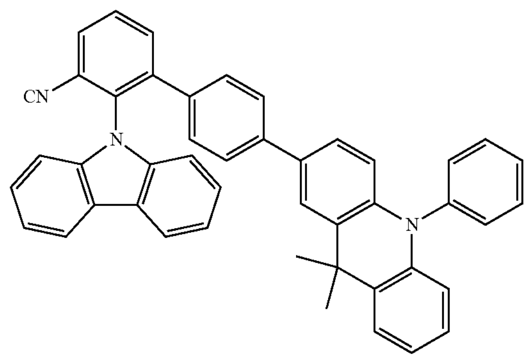
322
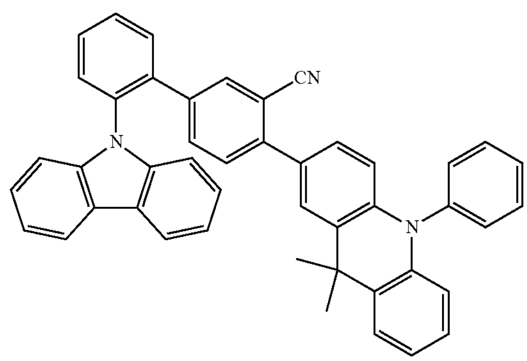
-continued
323
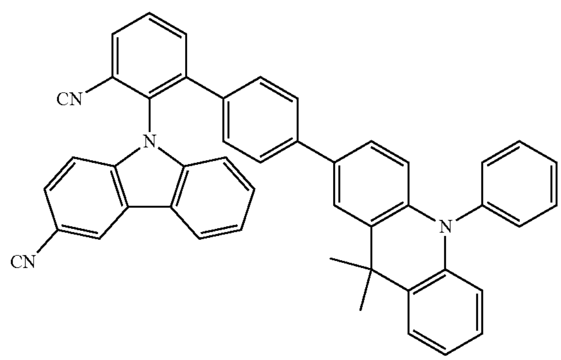
324
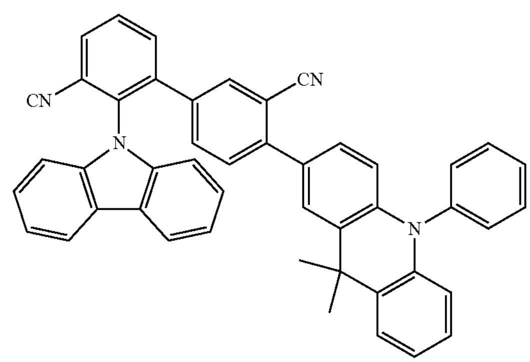
325
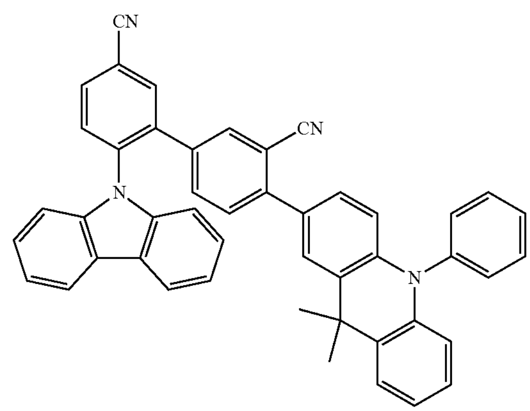
326
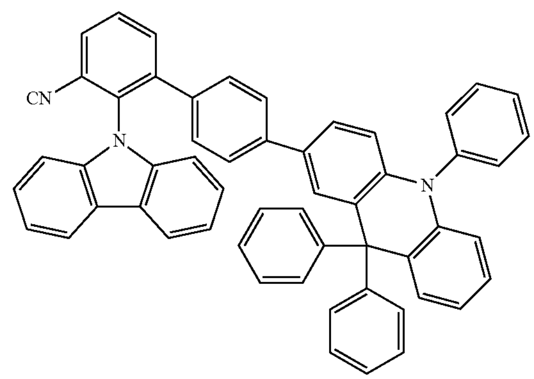

-continued
327
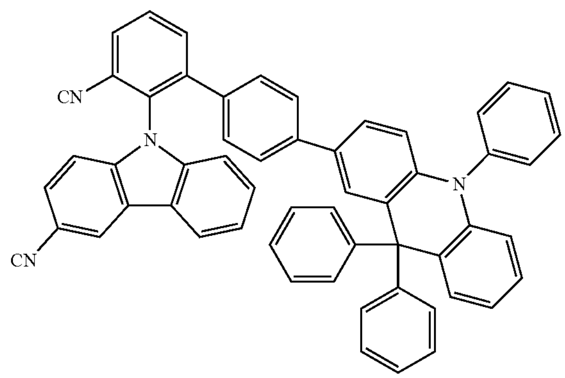
328
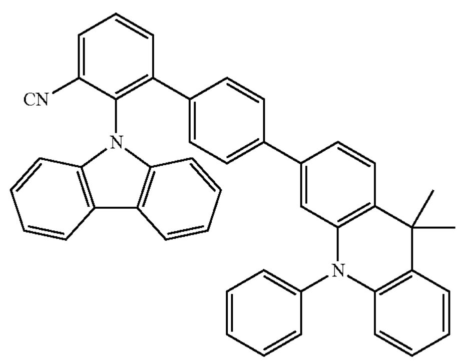
329
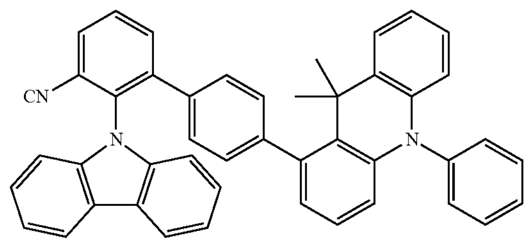
330
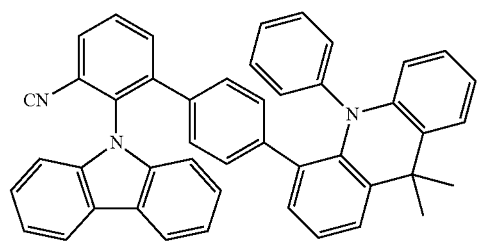
1
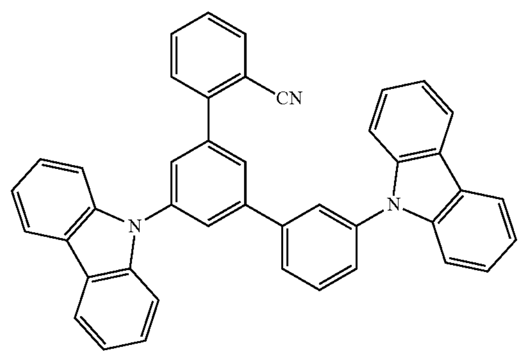
2
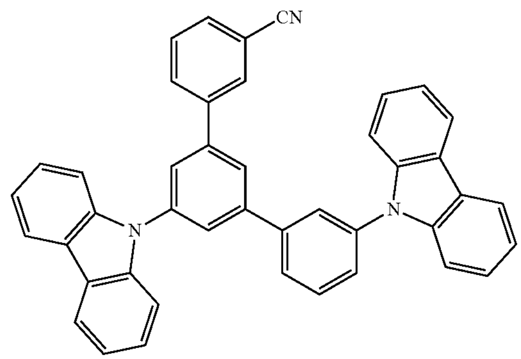
3
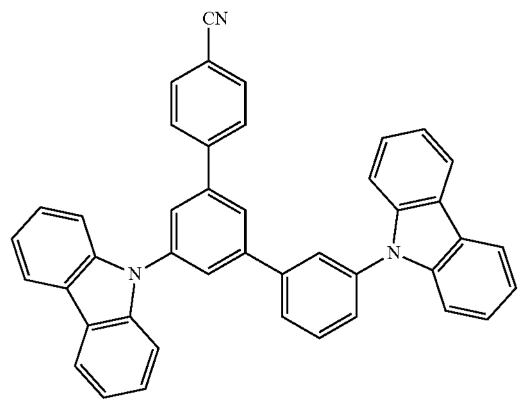
4
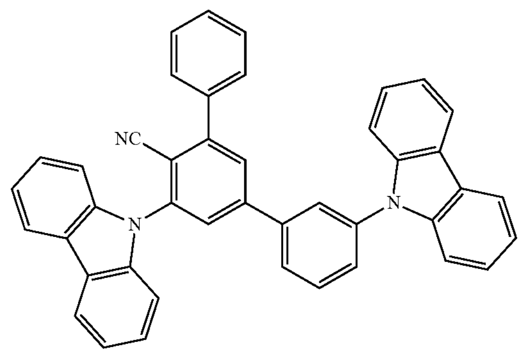

-continued
5
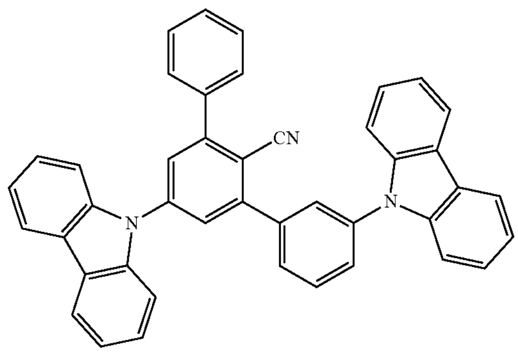
6
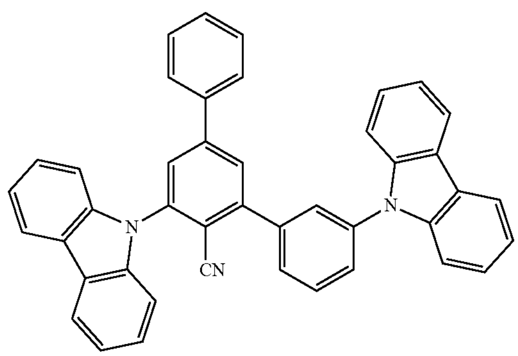
7
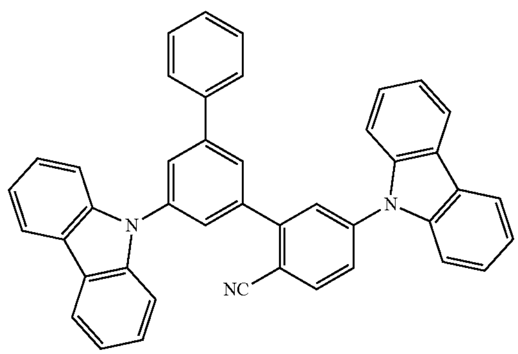
8
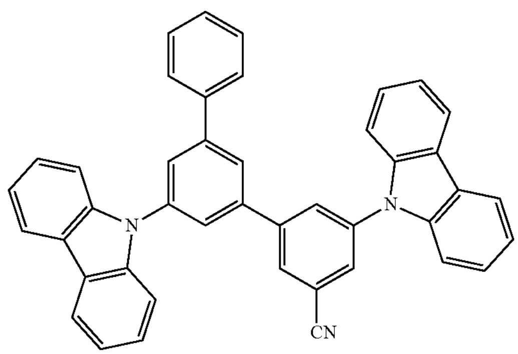
-continued
9
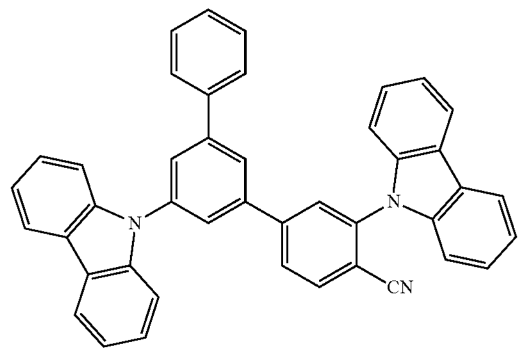
10
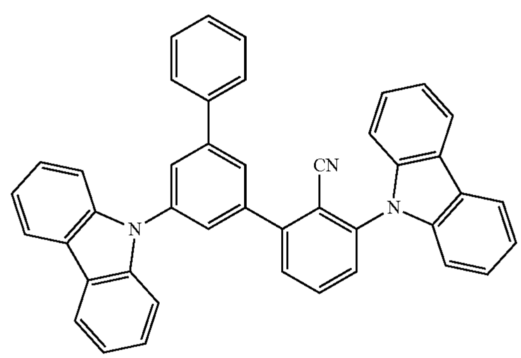
11
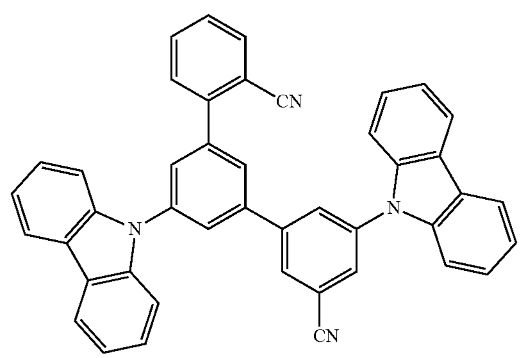
12
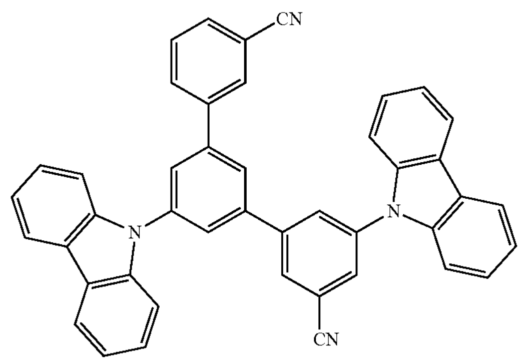

-continued
13
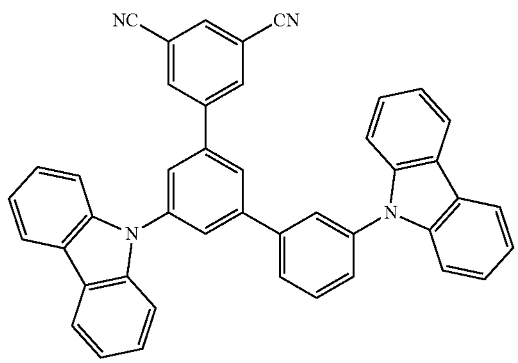
14
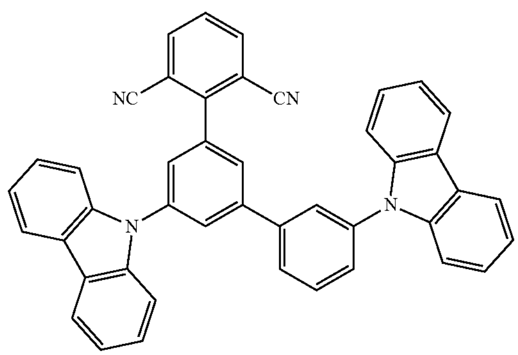
15
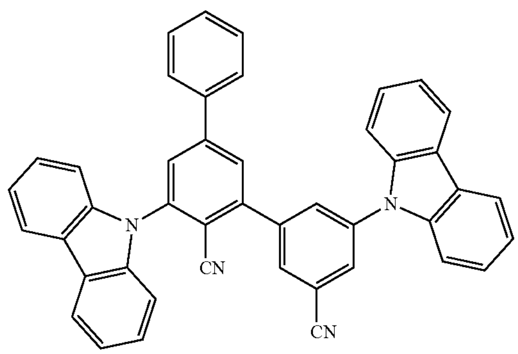
16
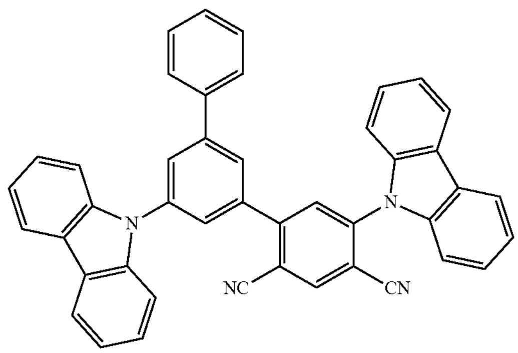
-continued
17
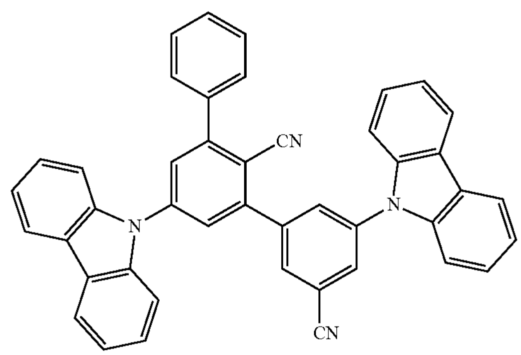
18
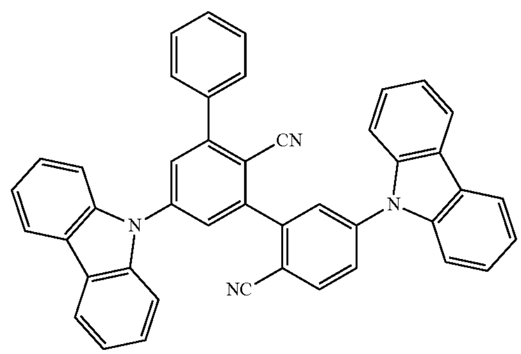
19
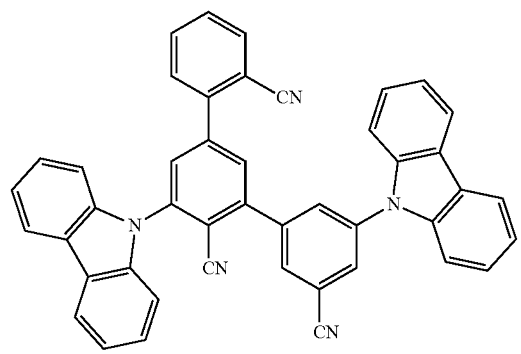
20
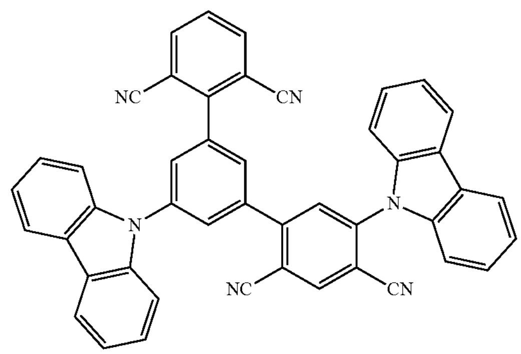

-continued
21
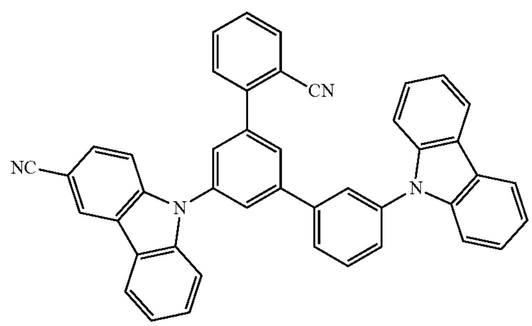
22
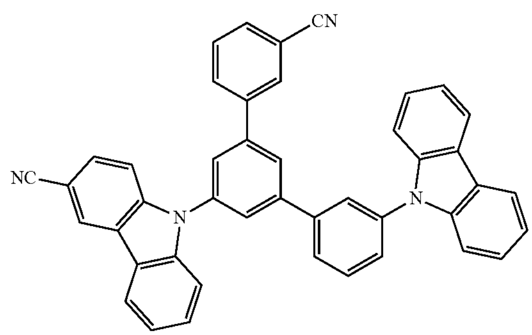
23
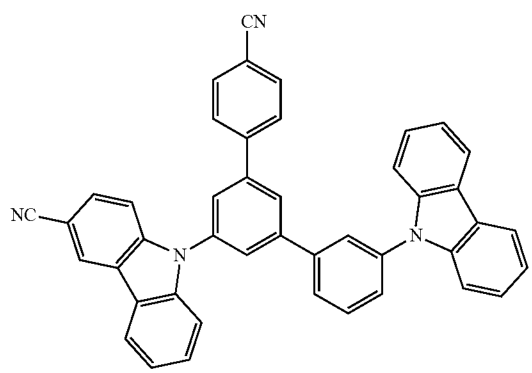
24
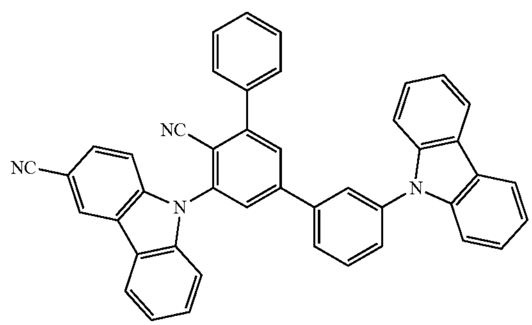
-continued
25
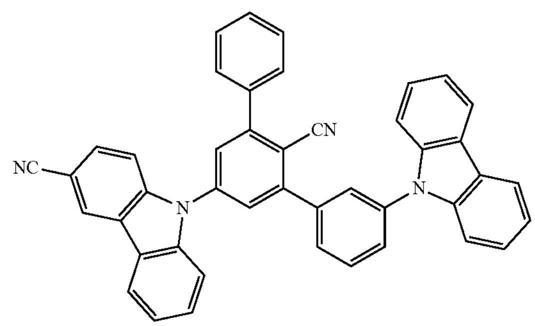
26
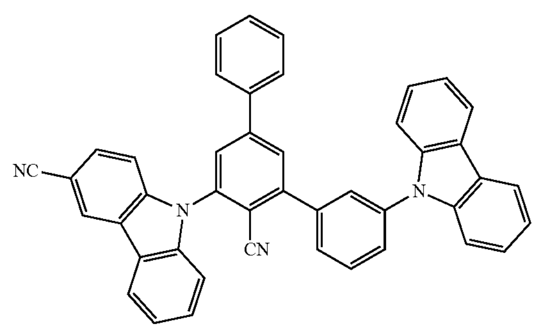
27
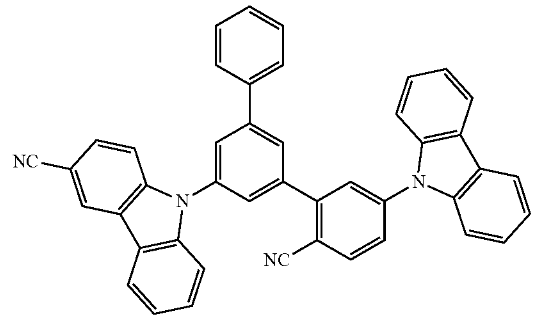
28
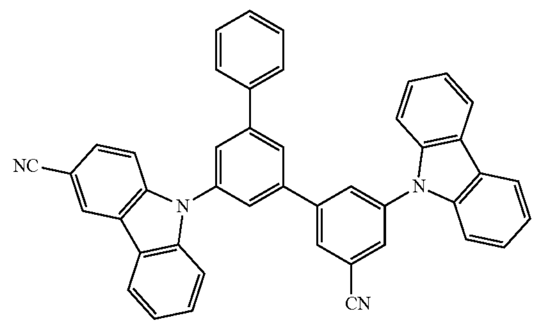

-continued
29
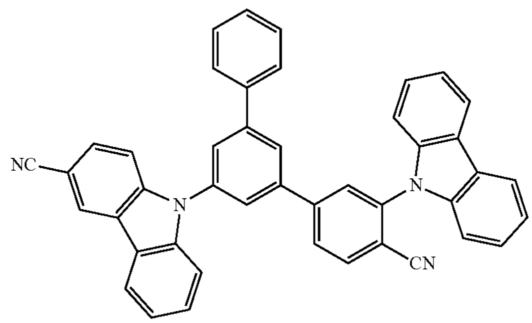
30
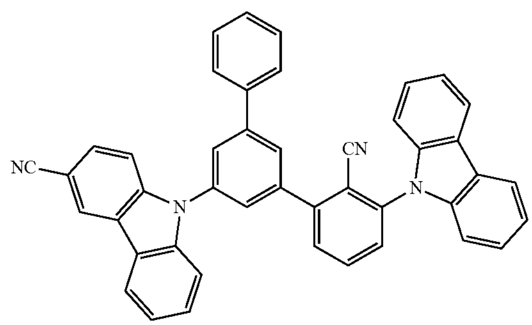
31
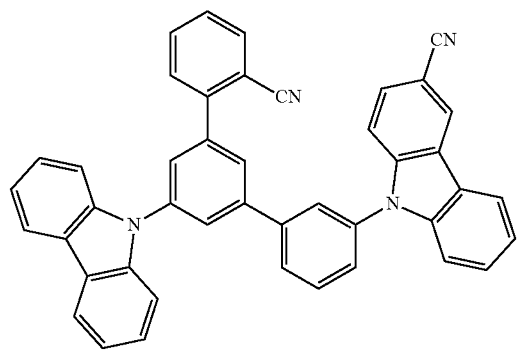
32
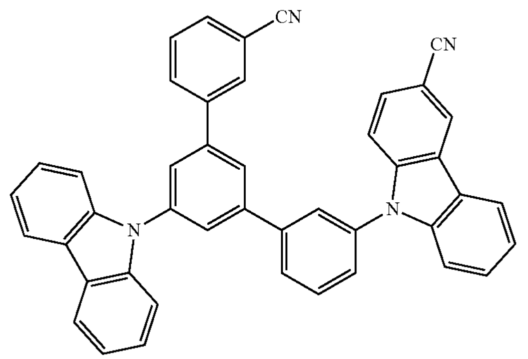
-continued
33
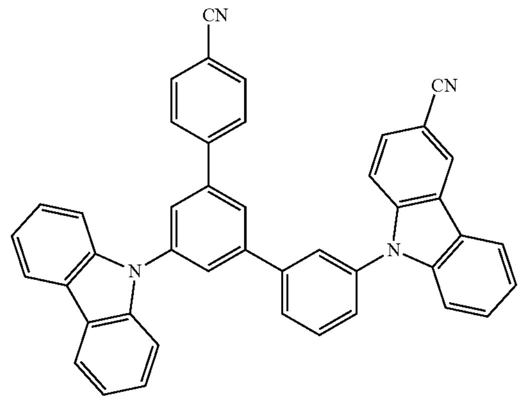
34
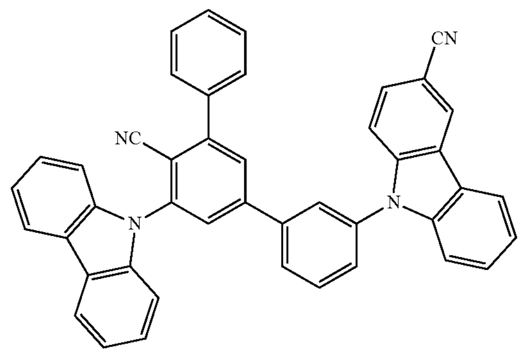
35
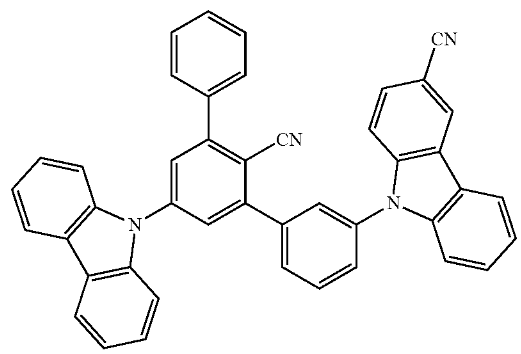
36
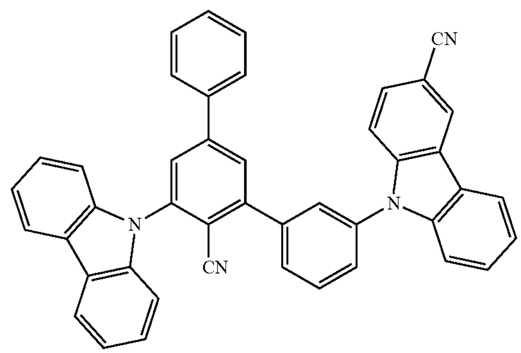

-continued
37
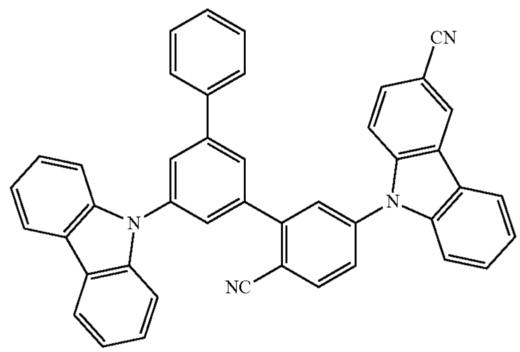
38
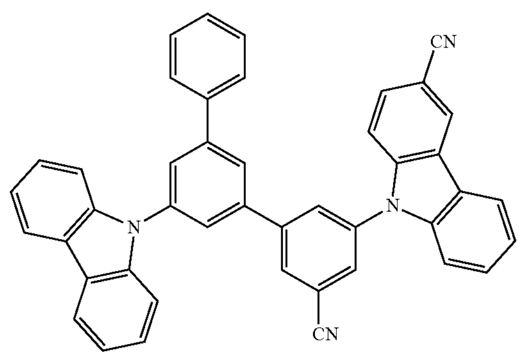
39
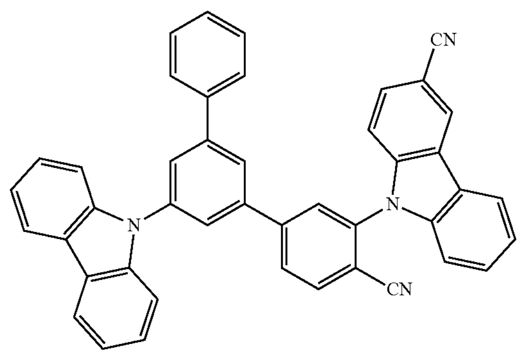
40
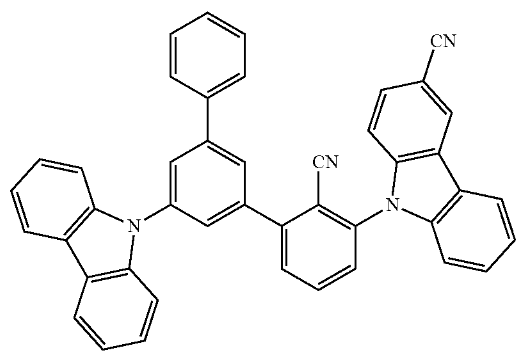
-continued
41
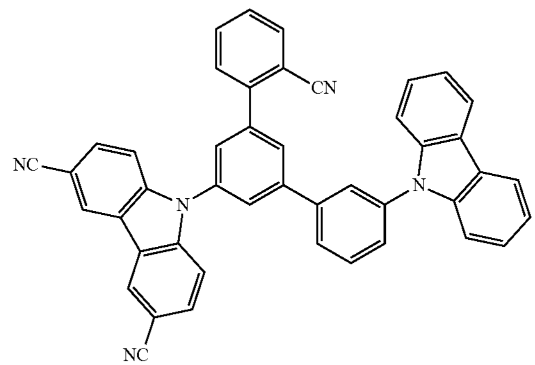
42
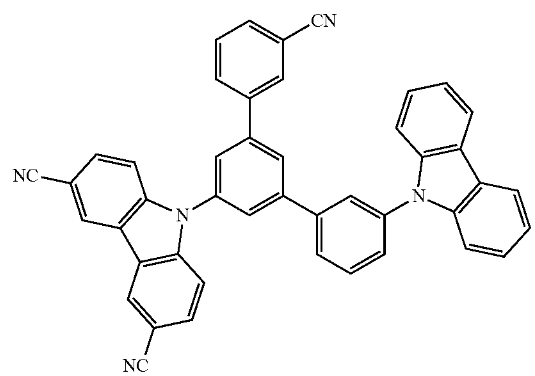
43
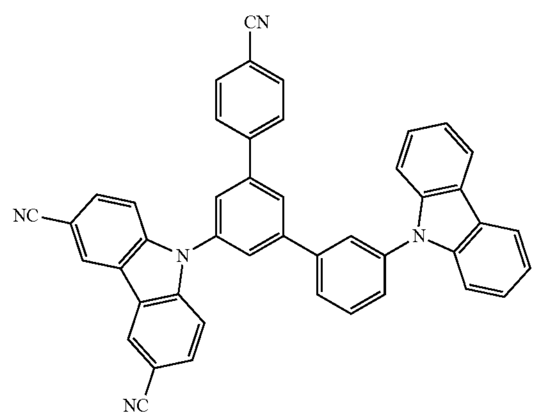
44
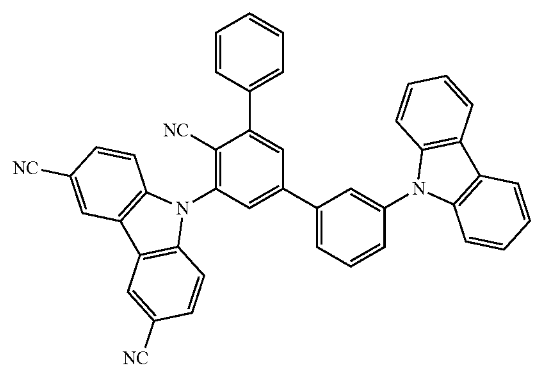

-continued
45
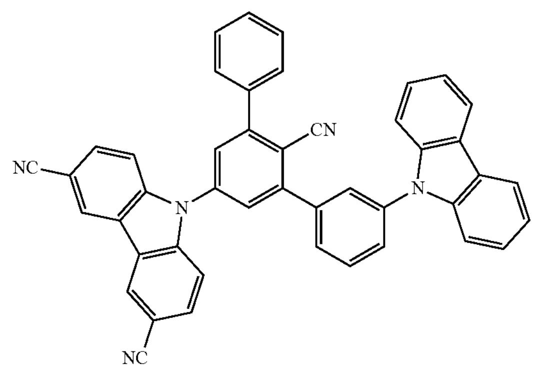
46
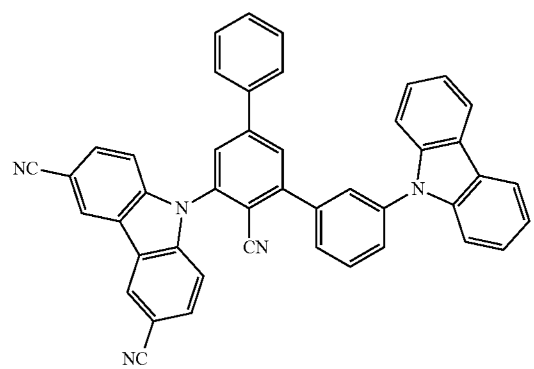
47
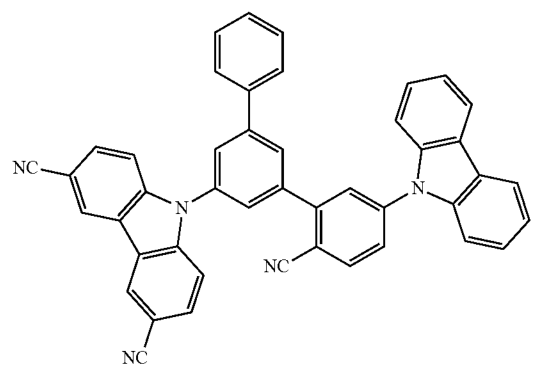
48
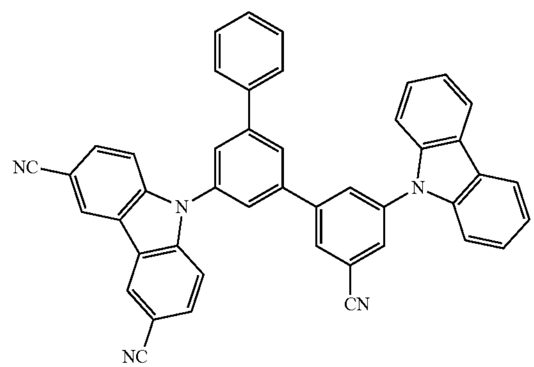
-continued
49
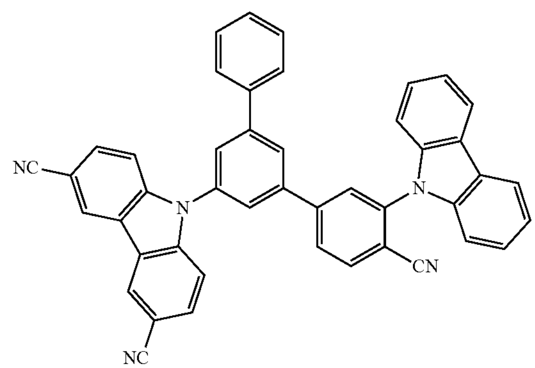
50
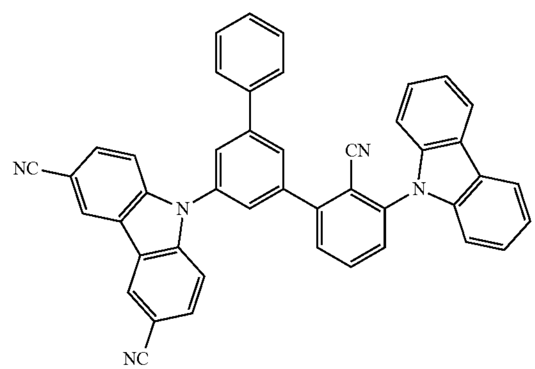
51
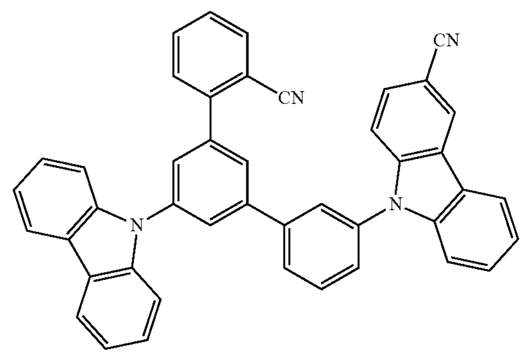
52
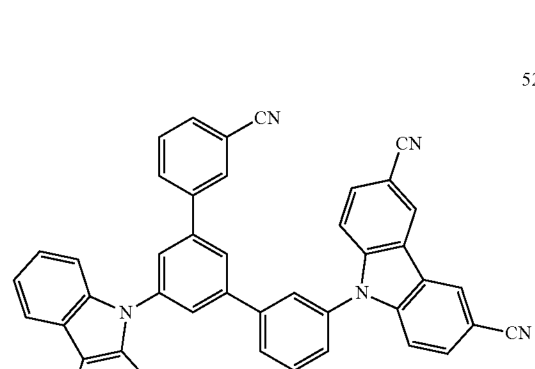

-continued
53
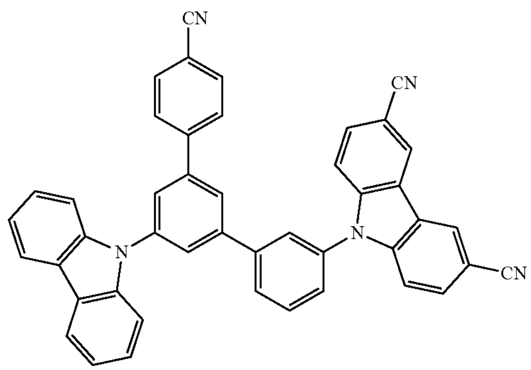
54
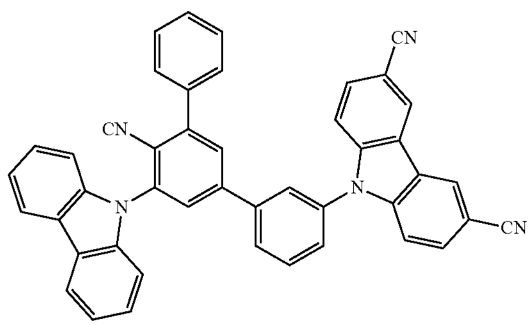
55
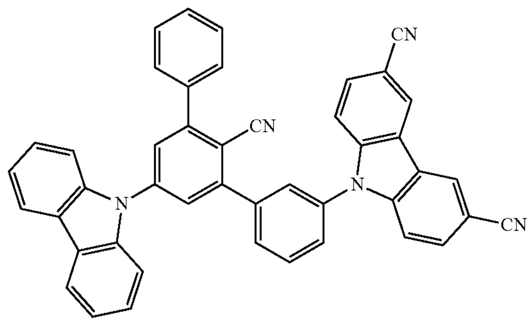
56
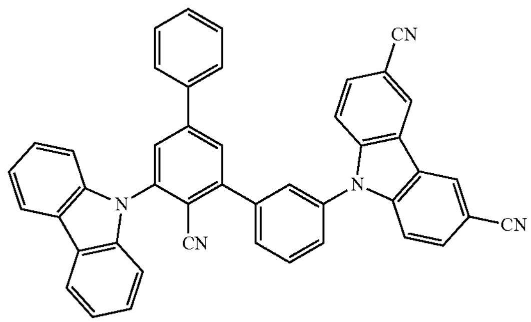
-continued
57
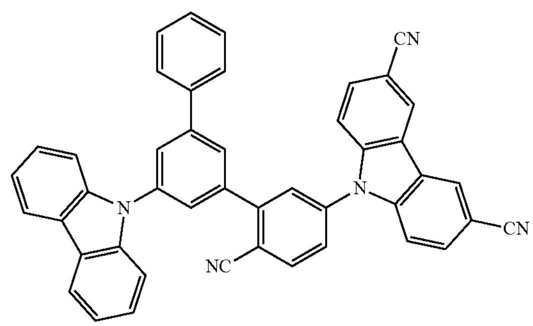
58
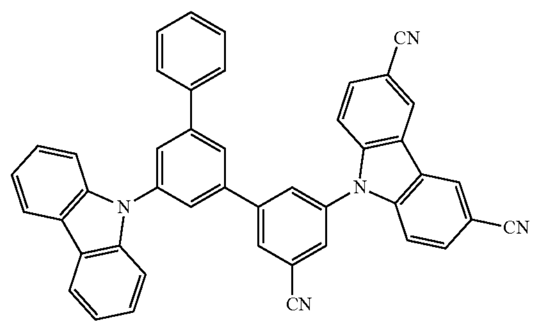
59
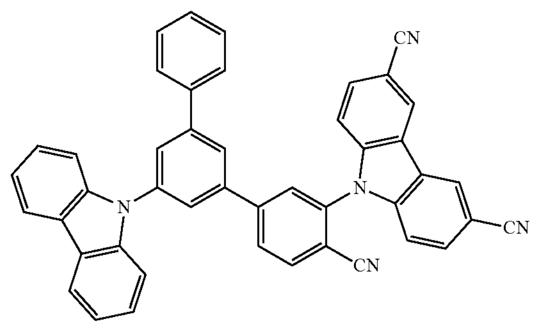
60
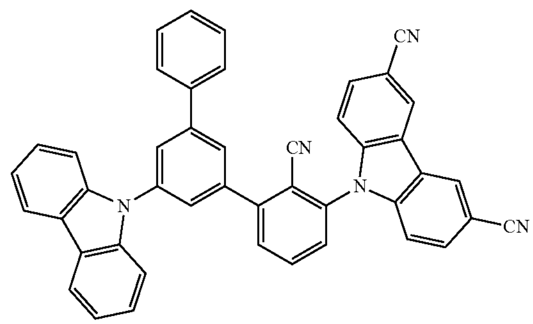

-continued
61
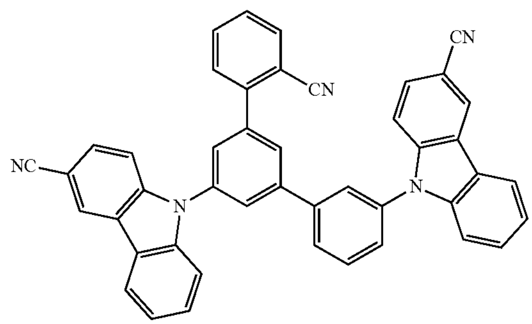
62
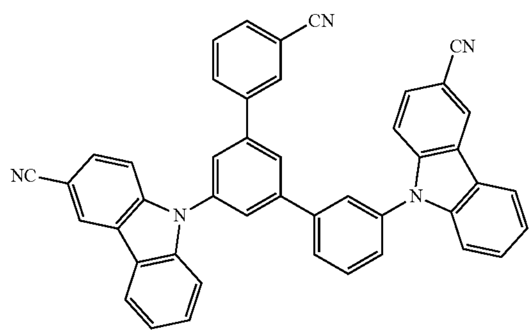
63
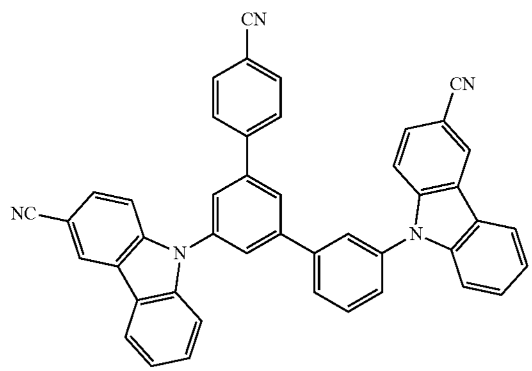
64
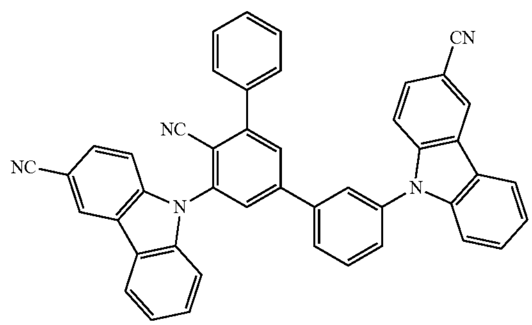
-continued
65
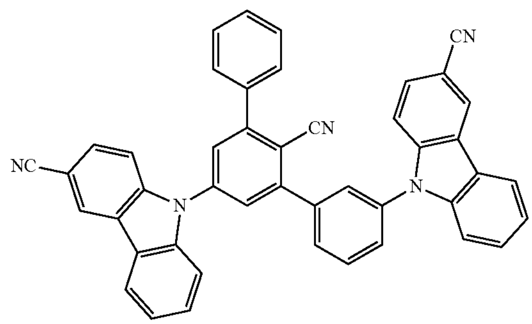
66
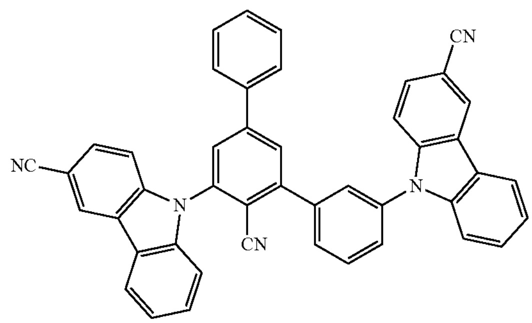
67
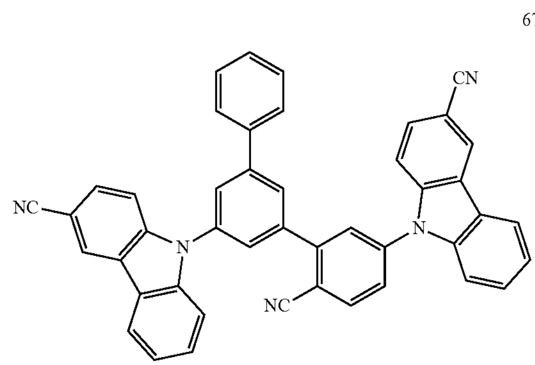
68
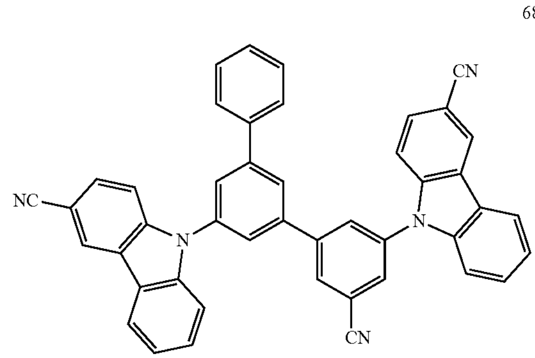

-continued
69
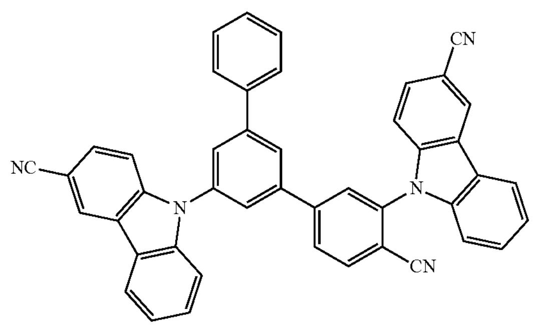
70
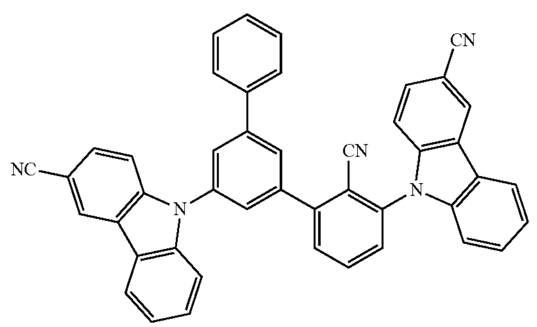
71
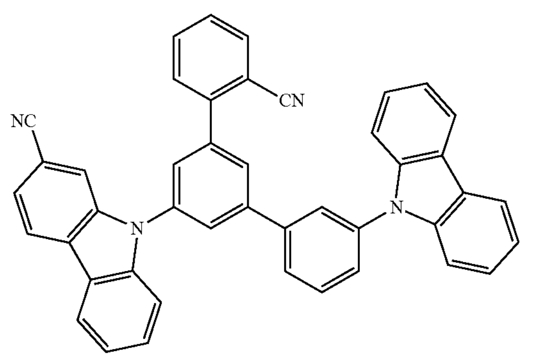
72
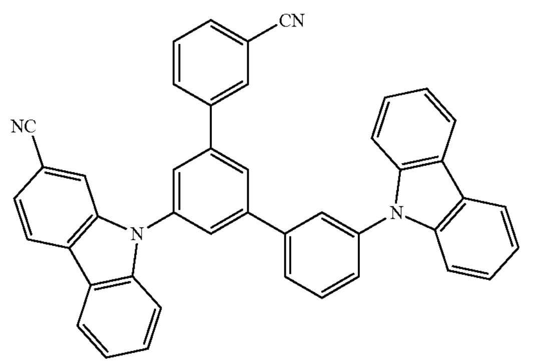
-continued
73
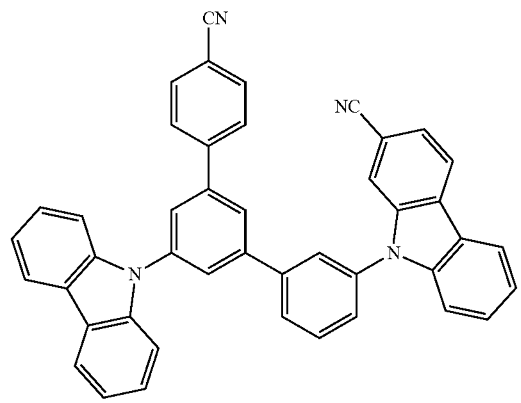
74
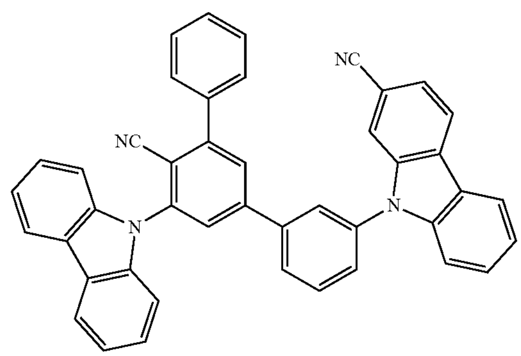
75
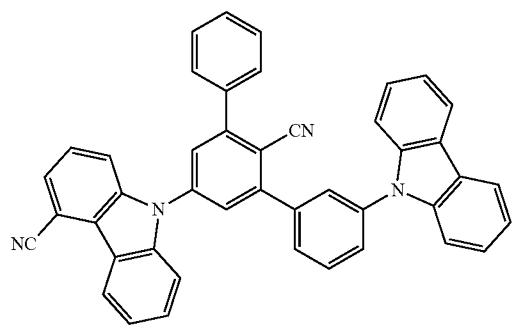
76
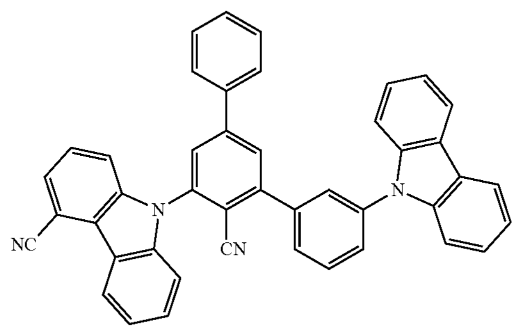

-continued
77
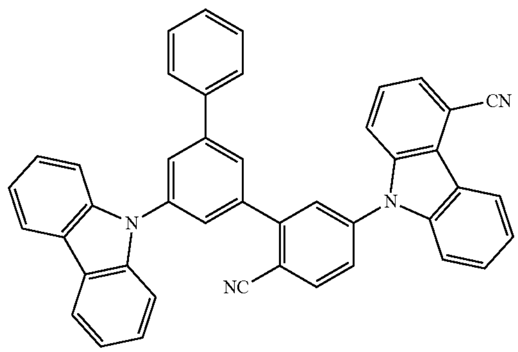
78
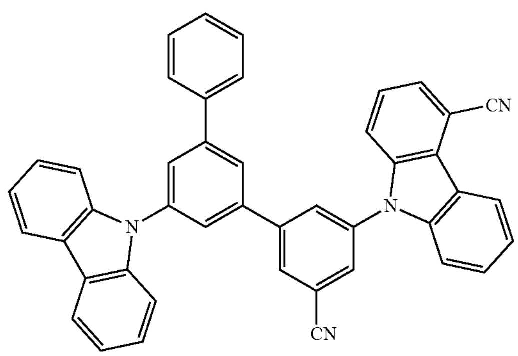
79
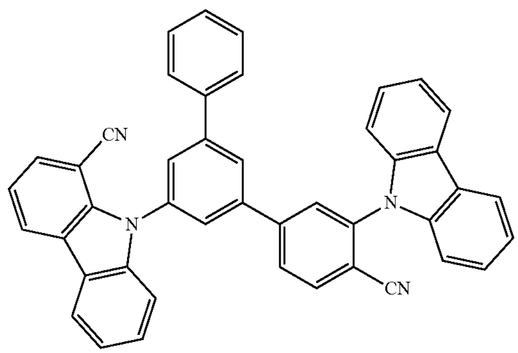
80
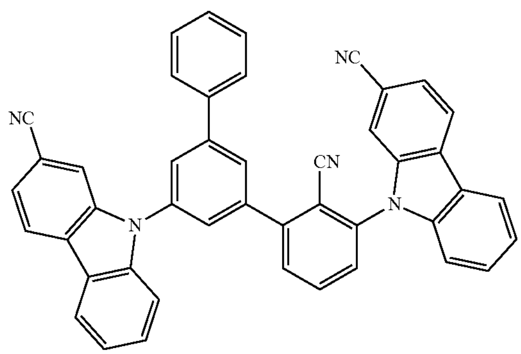
-continued
81
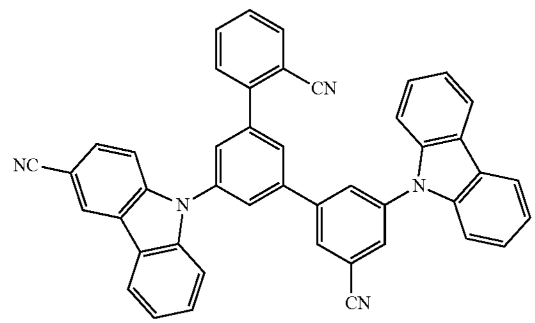
82
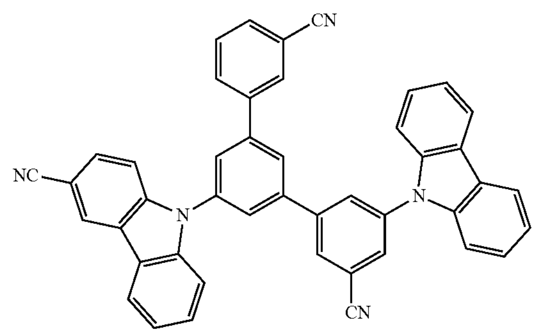
83
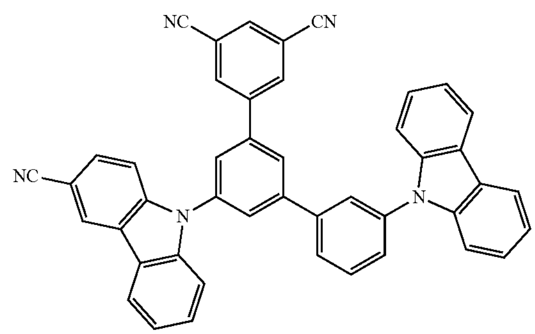
84
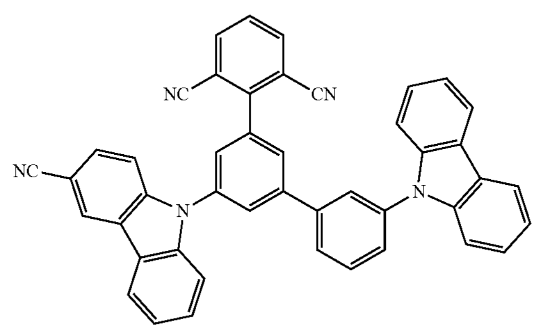

-continued
85
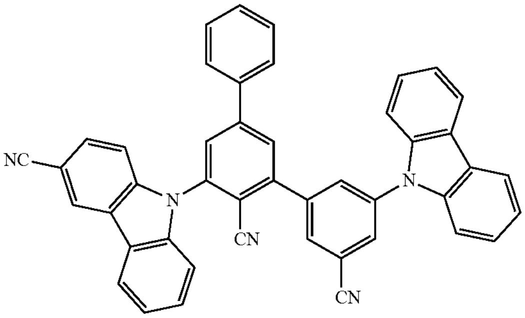
86
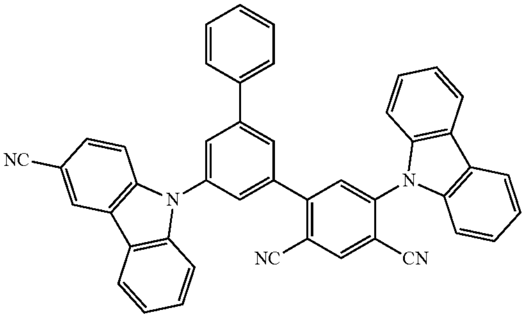
87
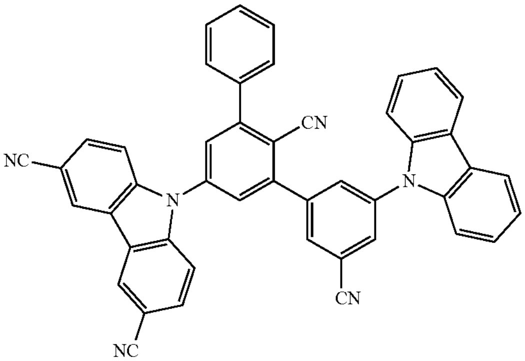
88
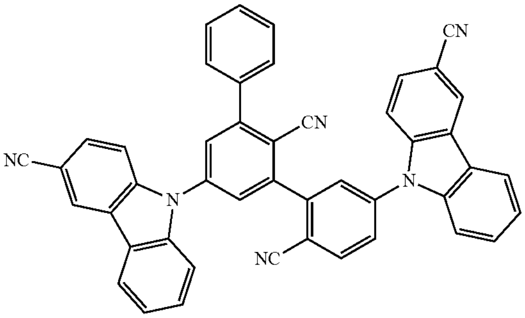
-continued
89
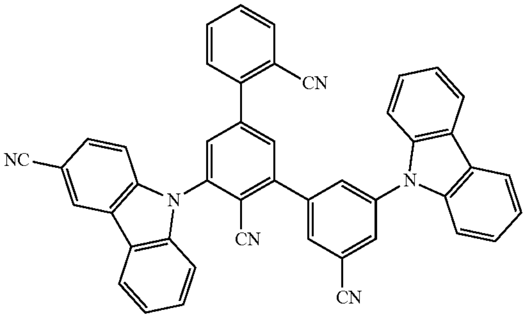
90
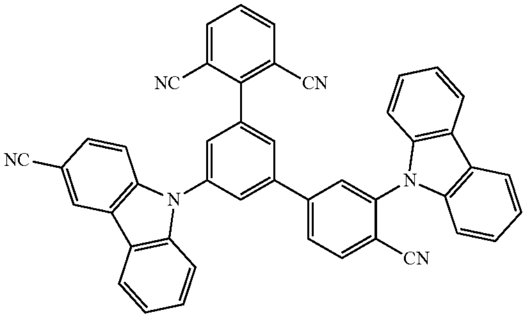
91
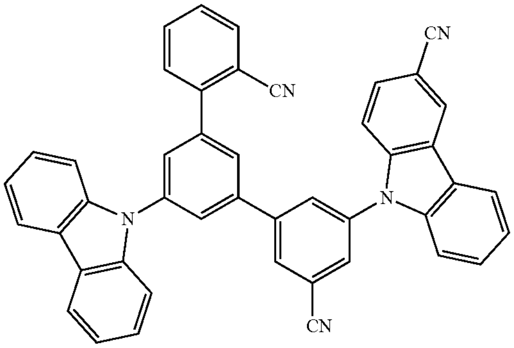
92
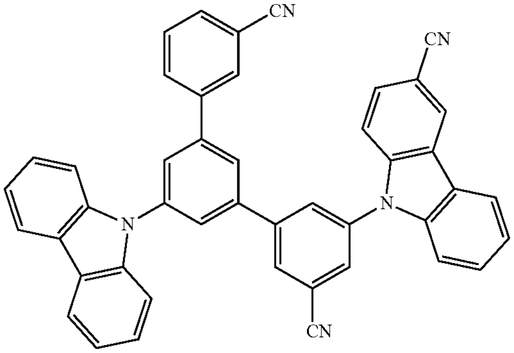

-continued
93
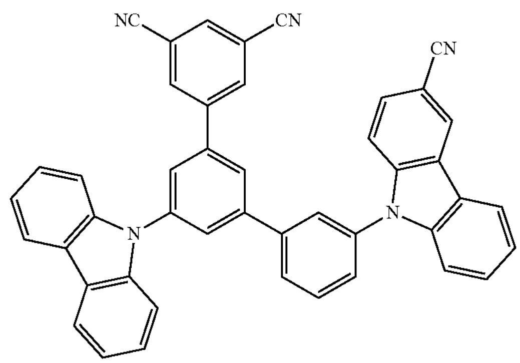
94
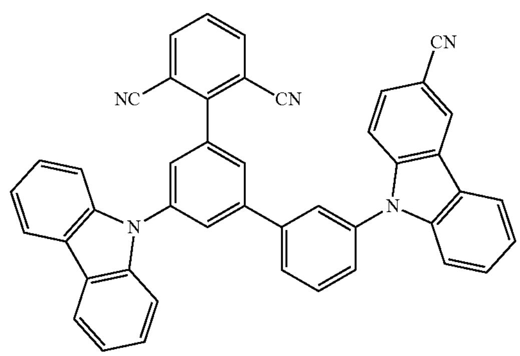
95
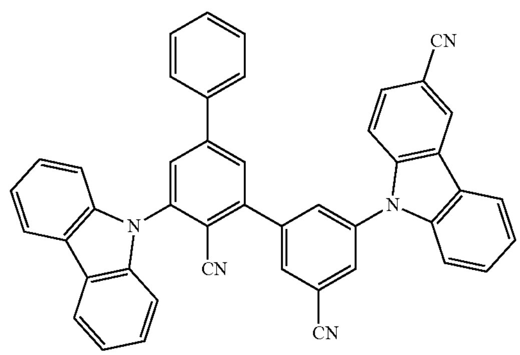
96
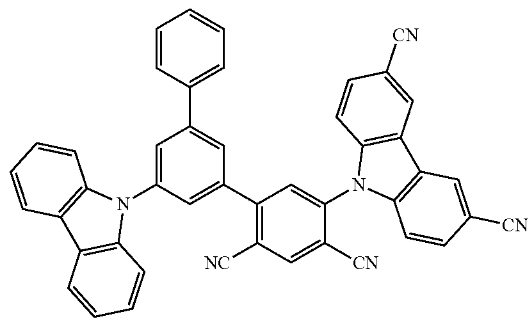
-continued
97
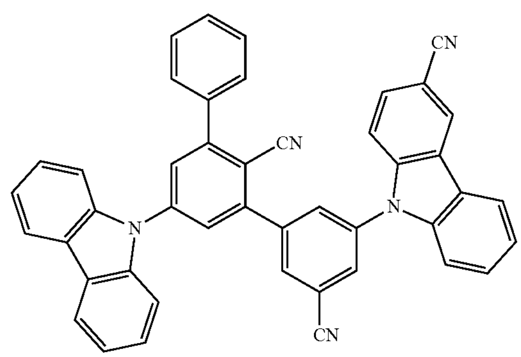
98
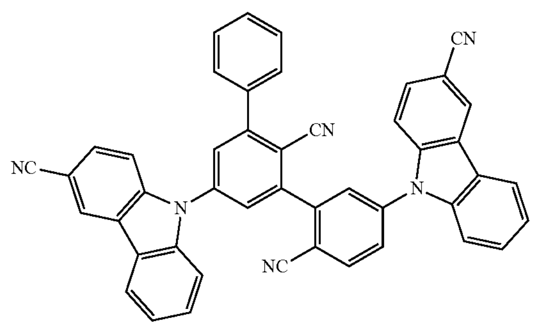
99
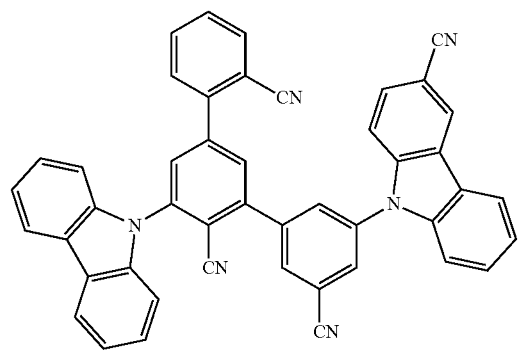
100
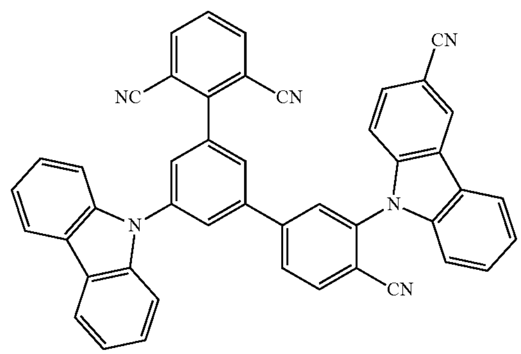

-continued
101
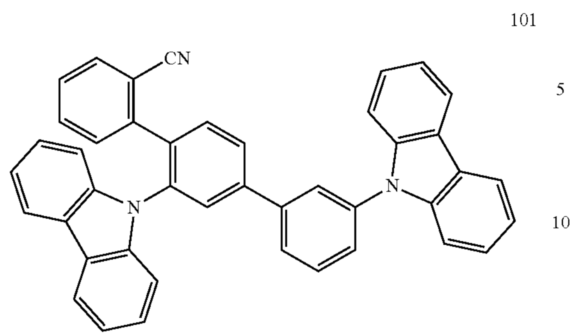
102
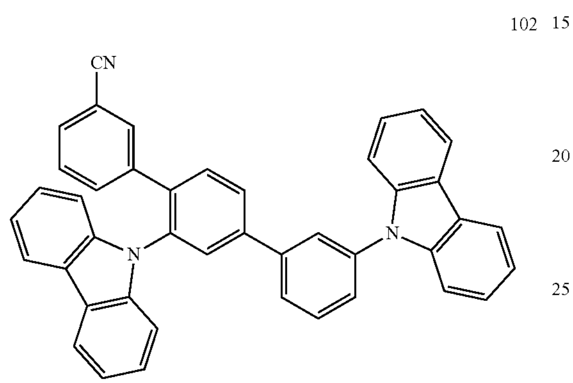
103
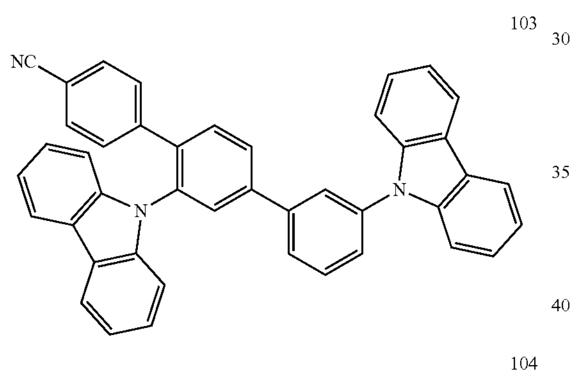
104
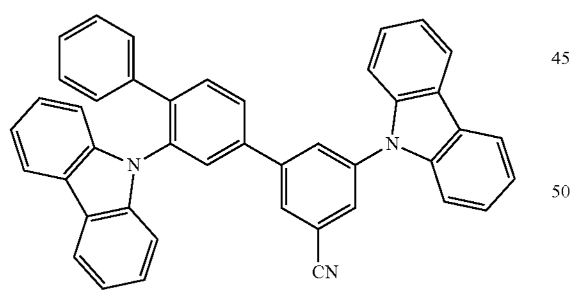
105
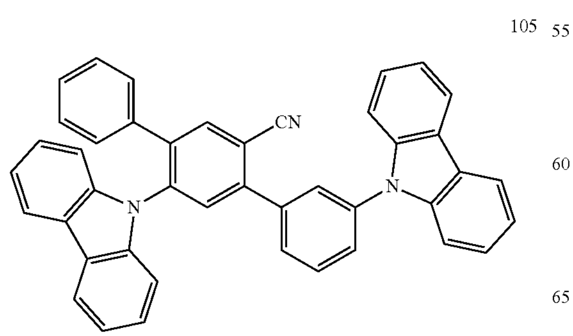
-continued
106
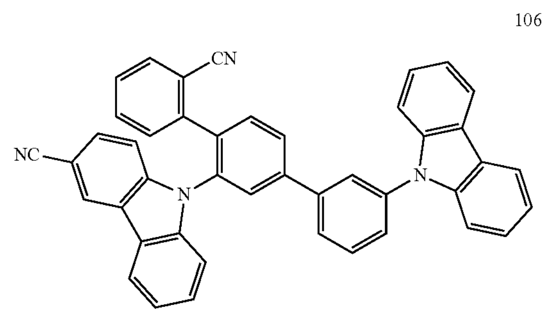
107
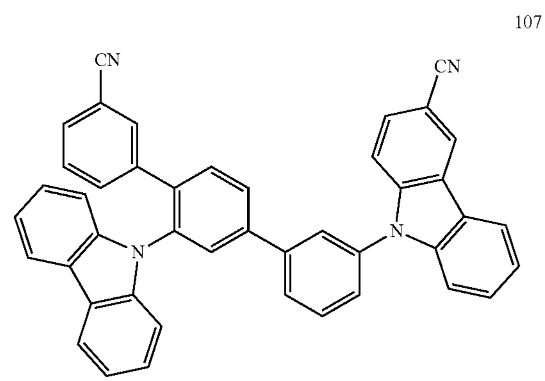
108
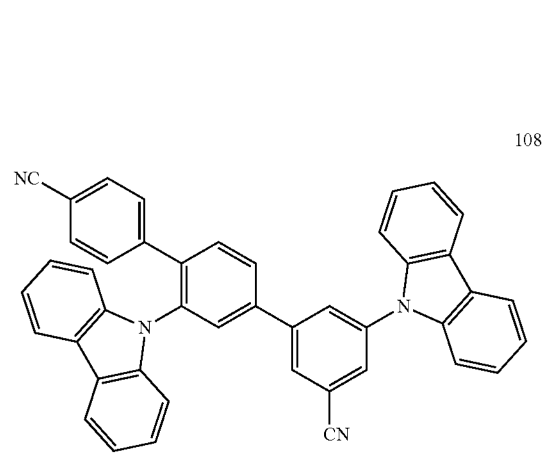
109
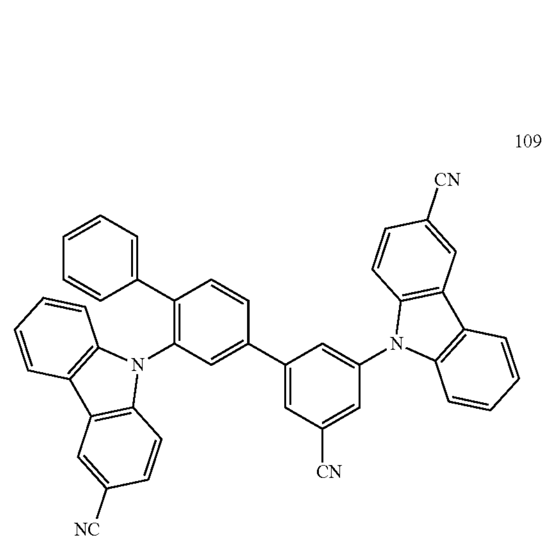

-continued
110
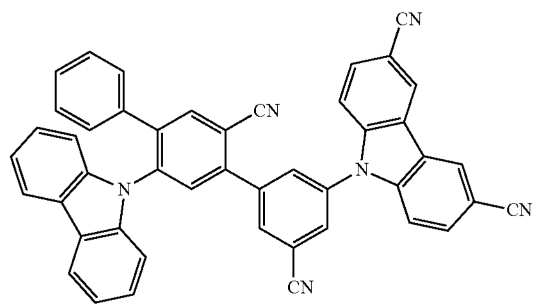
111
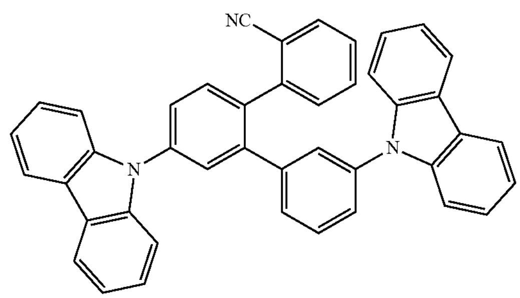
112
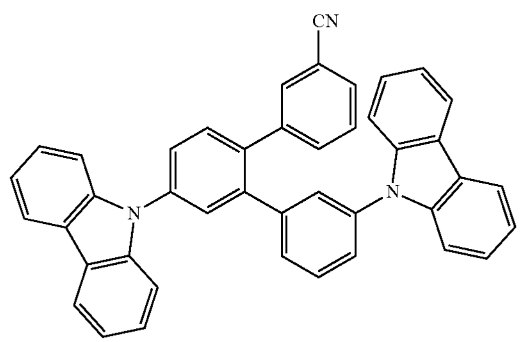
113
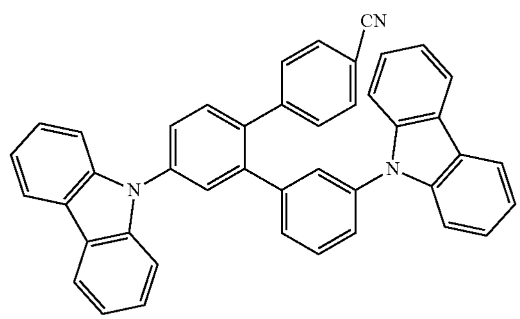
114
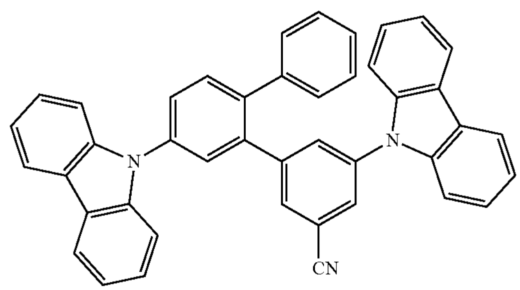
-continued
115
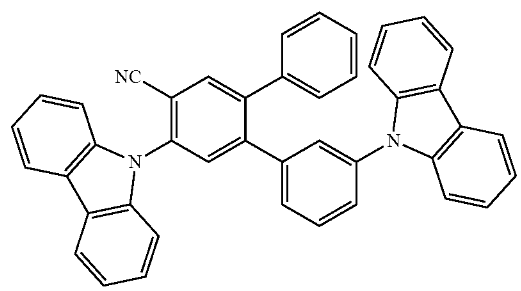
116
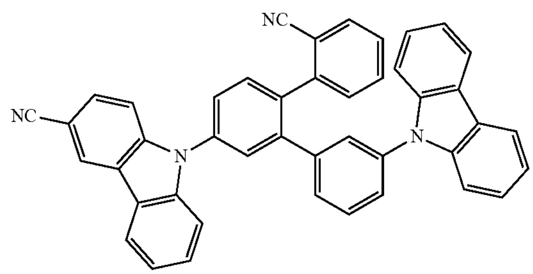
117
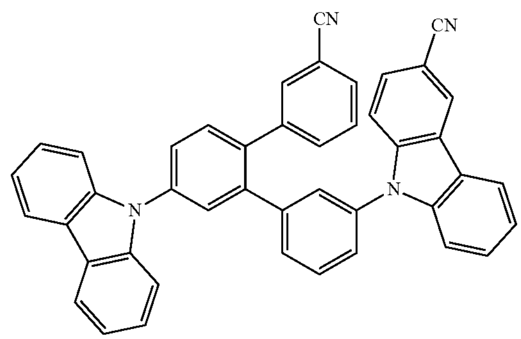
118
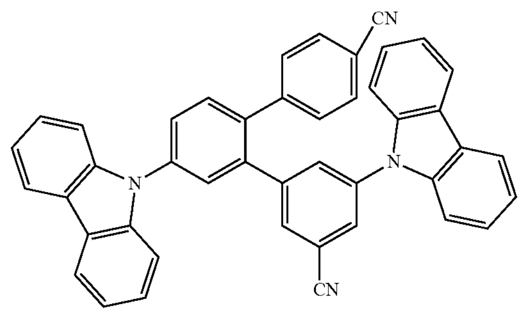

-continued
119
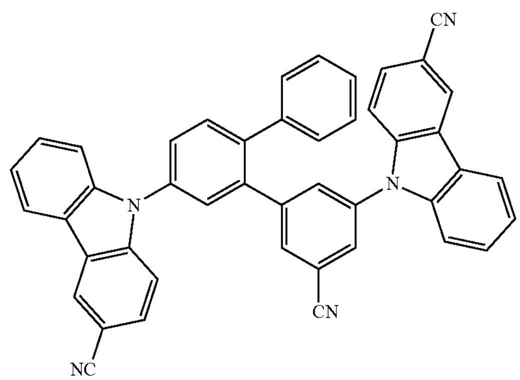
120
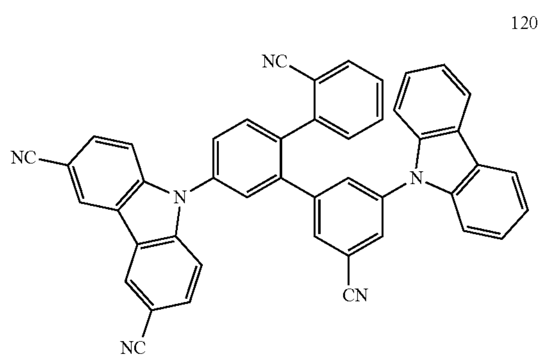
121
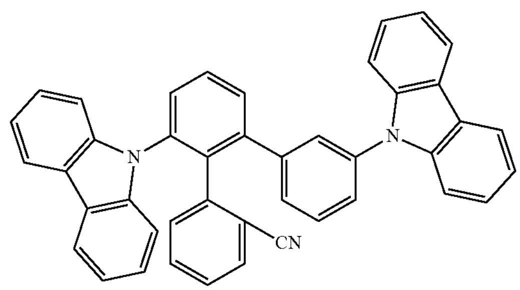
122
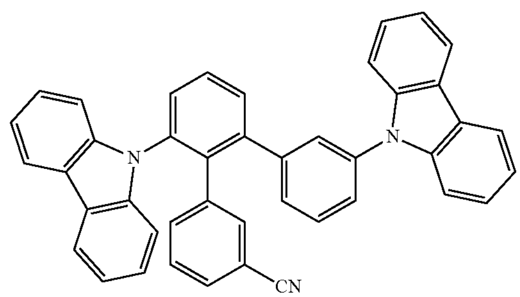
-continued
123
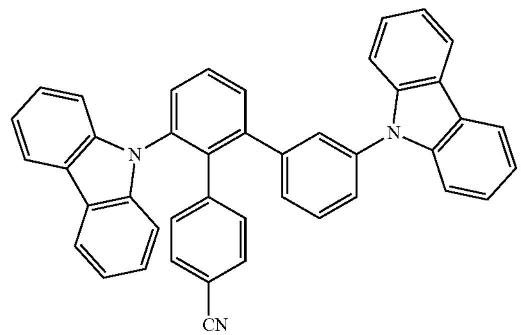
124
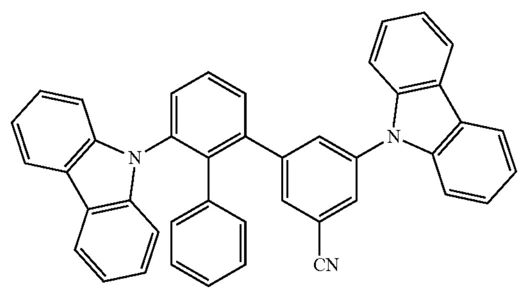
125
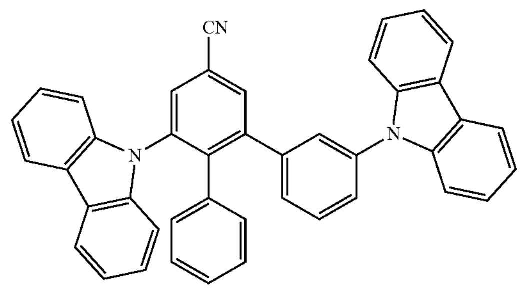
126
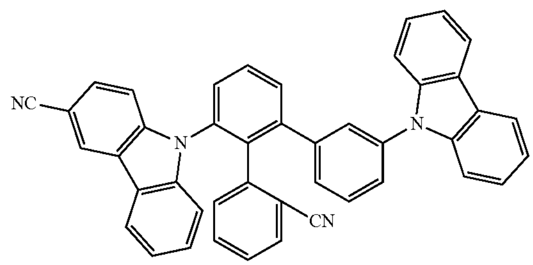
127
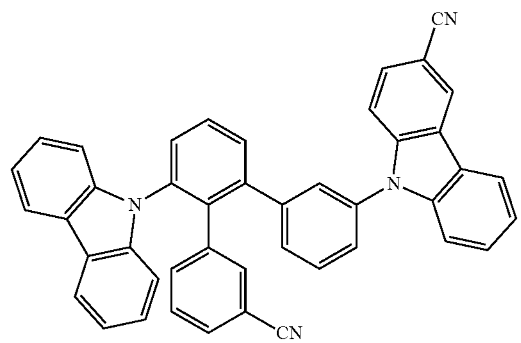

-continued
128
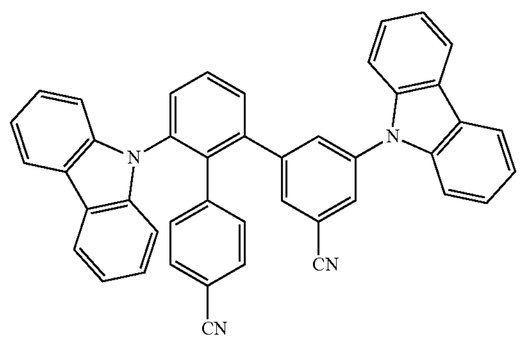
129
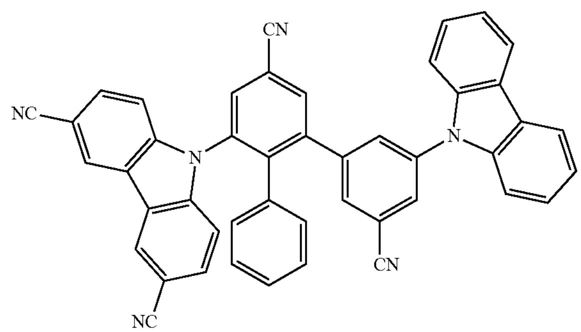
130
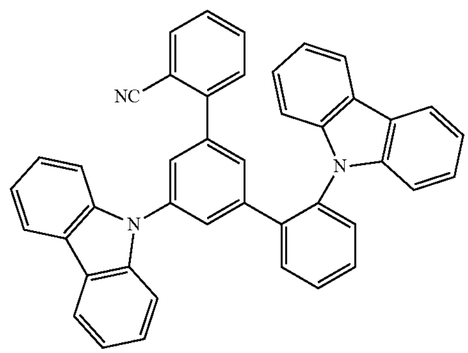
131
-continued
132
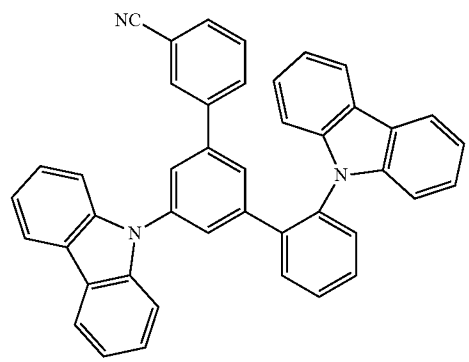
133
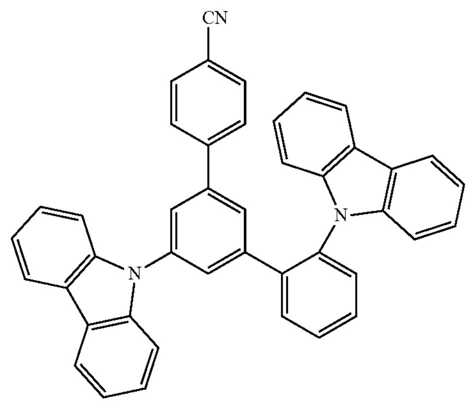
134
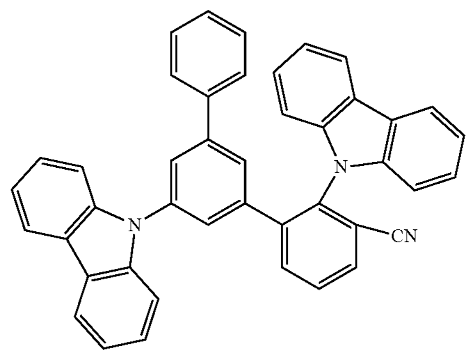
135
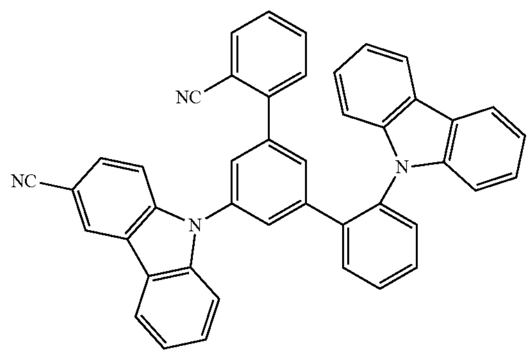

-continued
136
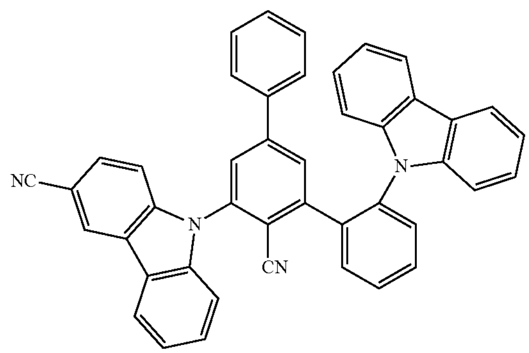
137
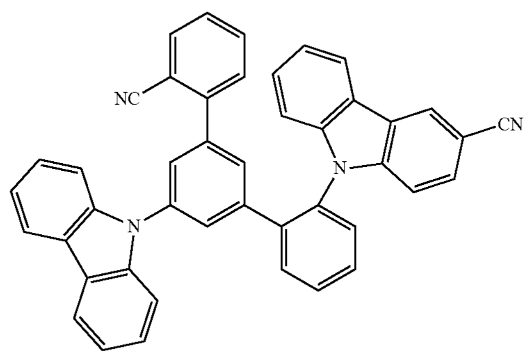
138
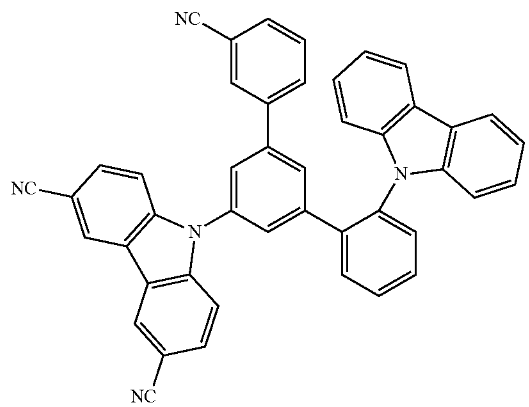
139
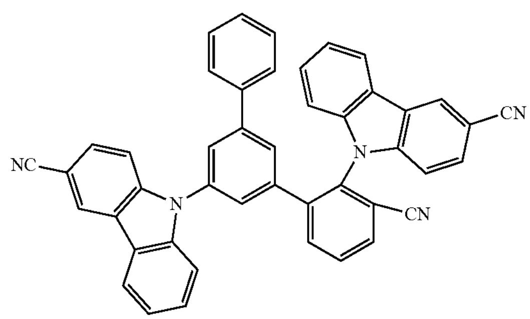
-continued
140
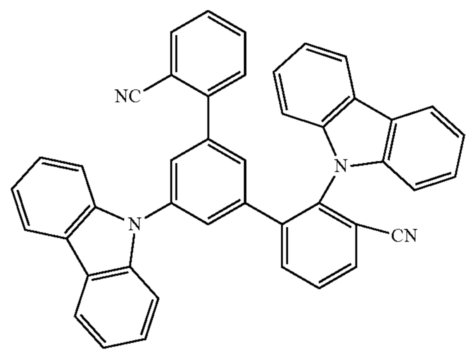
141
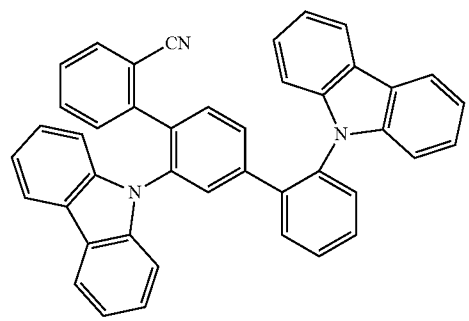
142
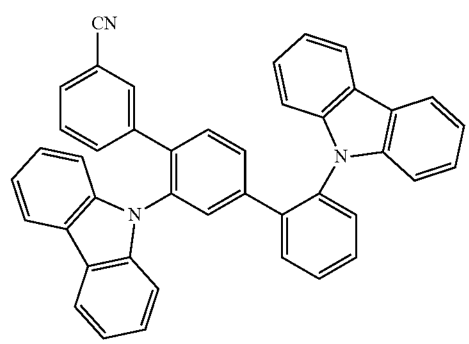
143
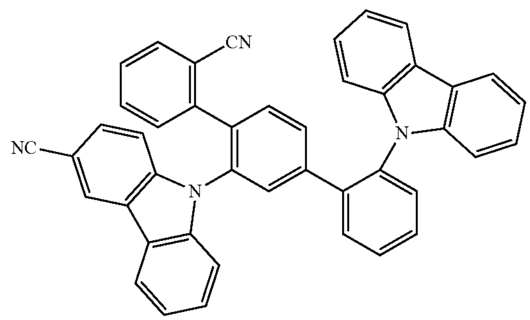

-continued
144
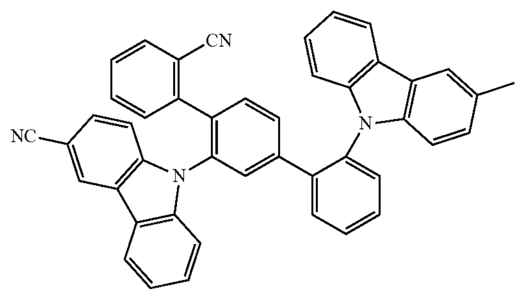
145
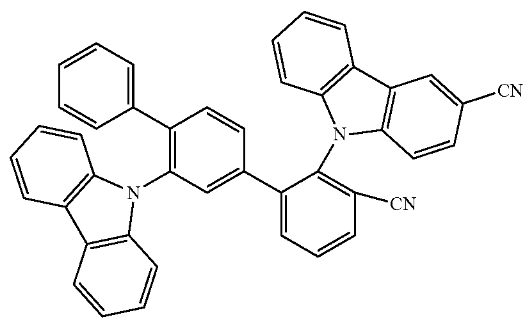
146
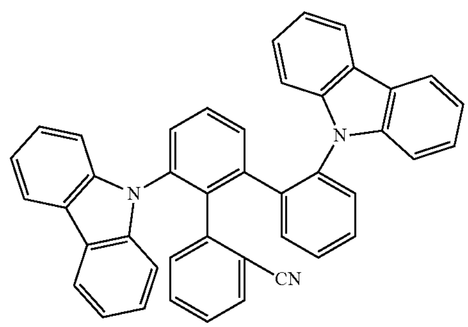
147
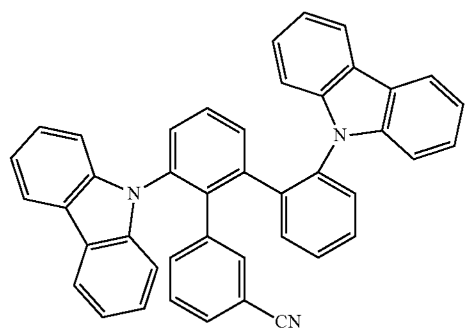
148
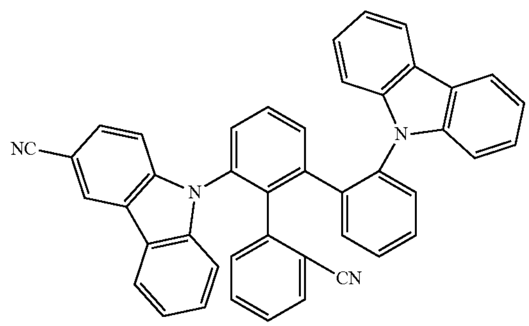
-continued
149
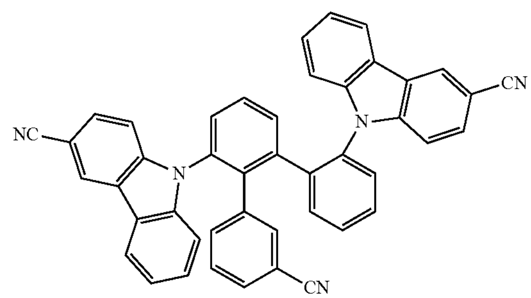
150
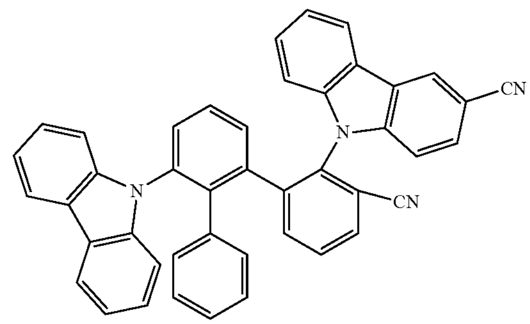
151
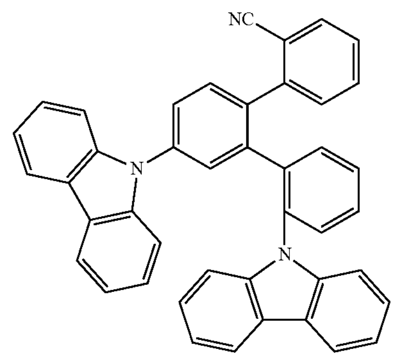
152
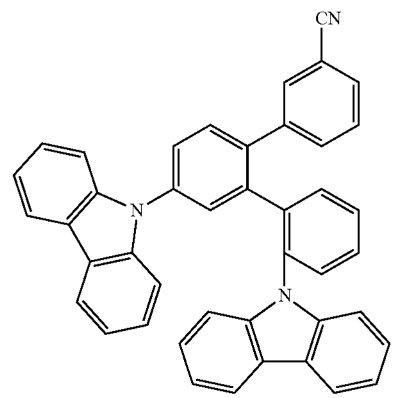

-continued
153
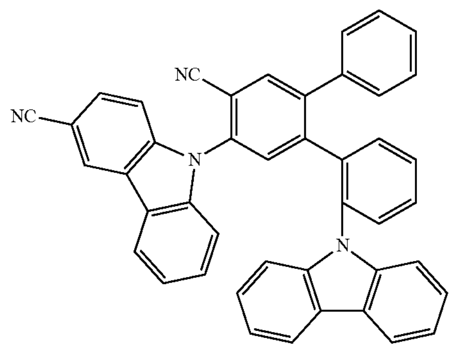
154
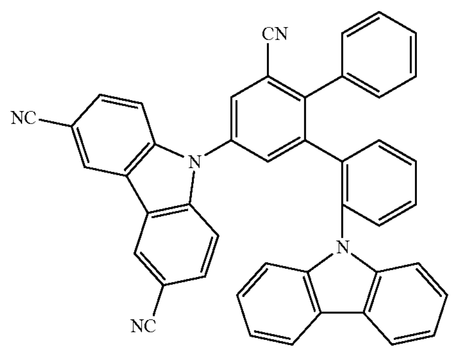
155
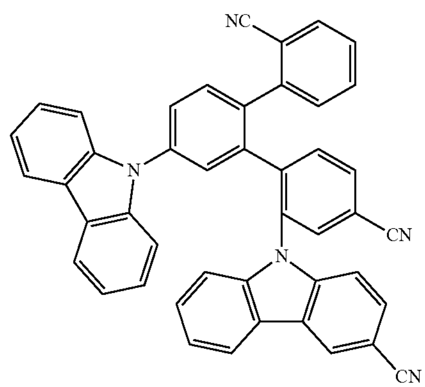
156
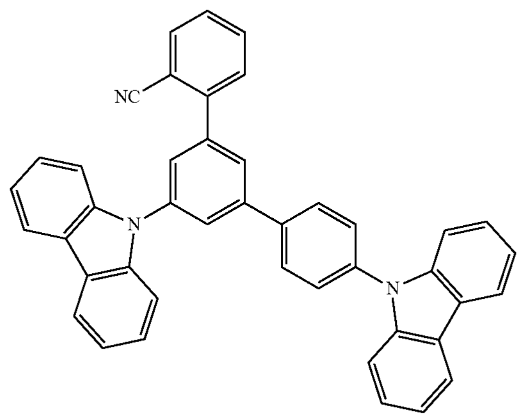
-continued
157
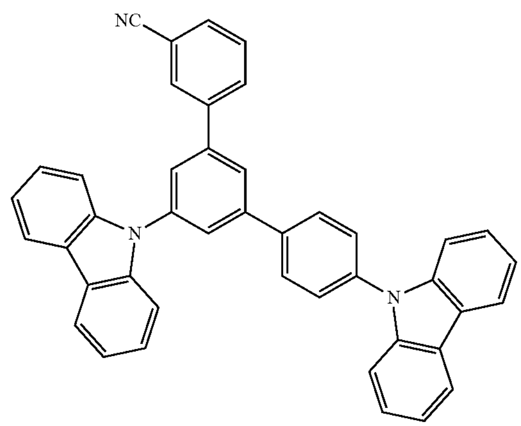
158
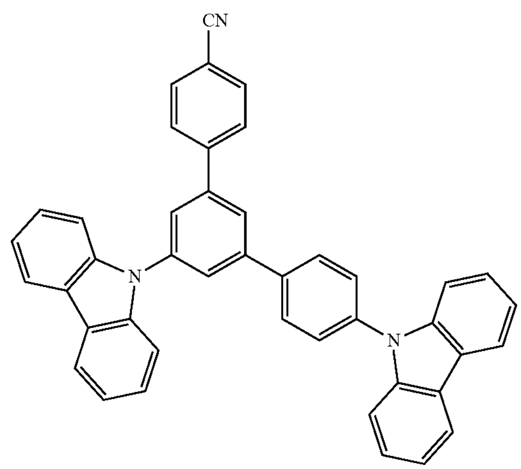
159
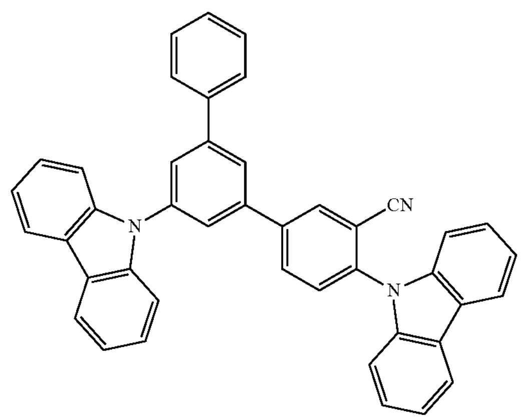

160
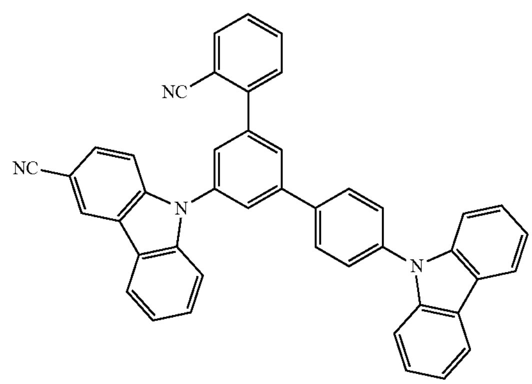
161
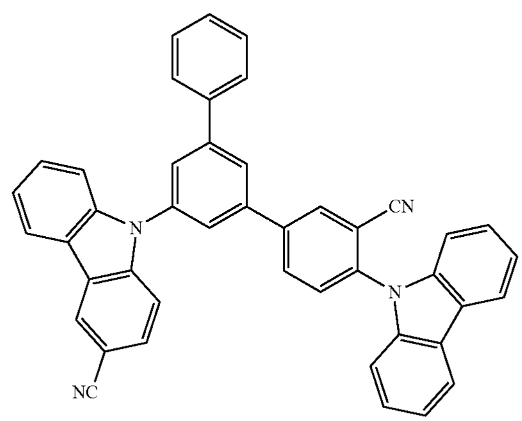
162
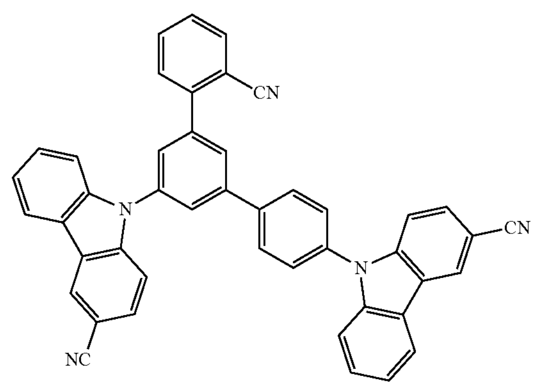
163
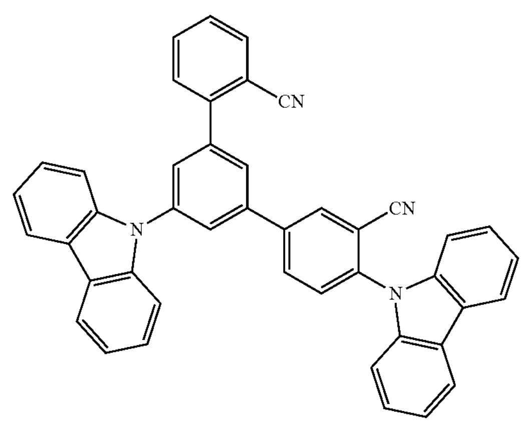
164
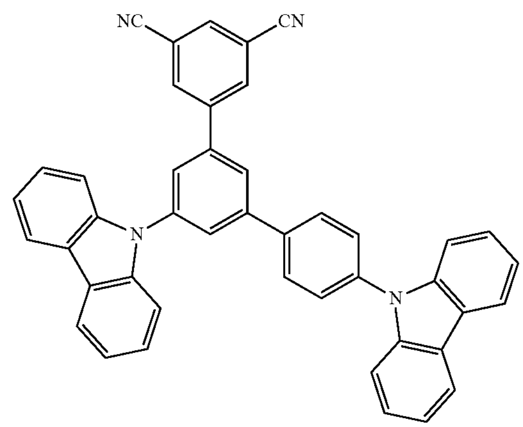
165
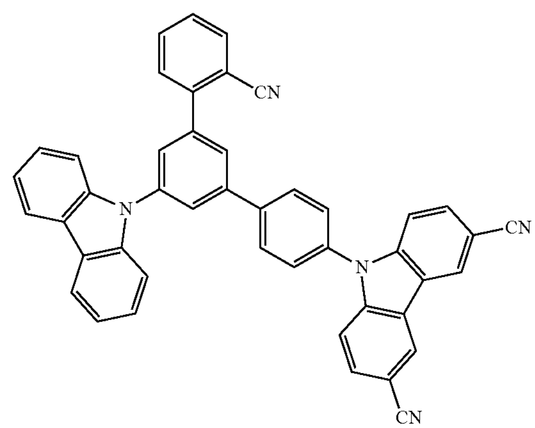

-continued
166
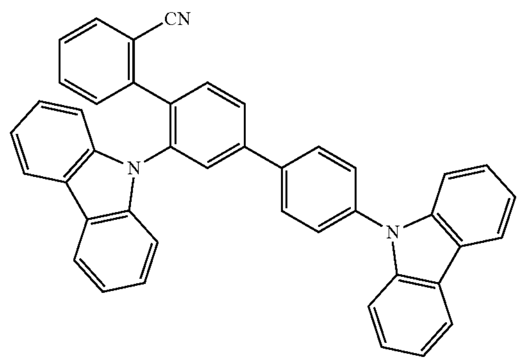
167
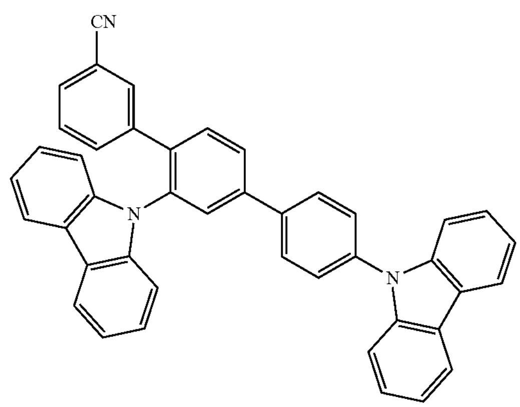
168
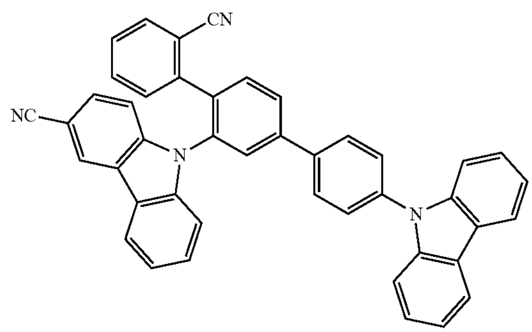
169
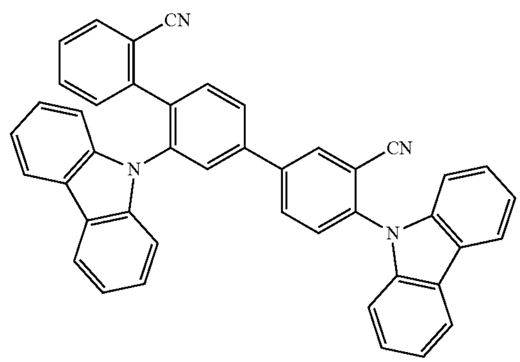
-continued
170
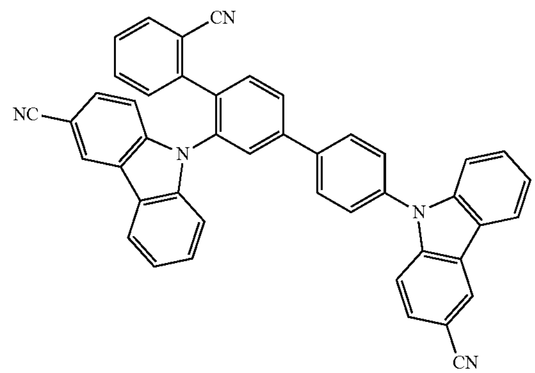
171
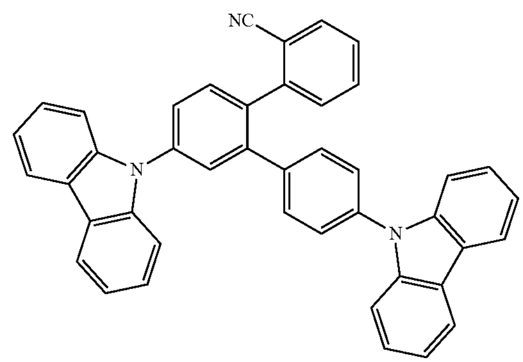
172
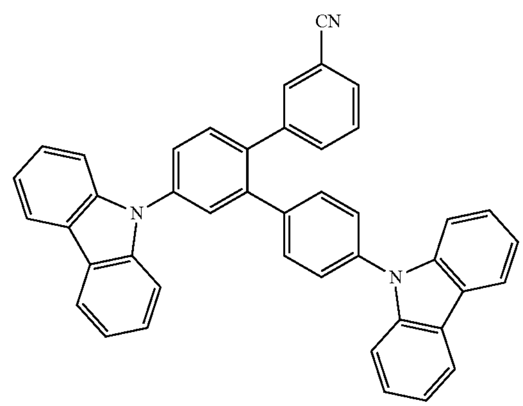
173
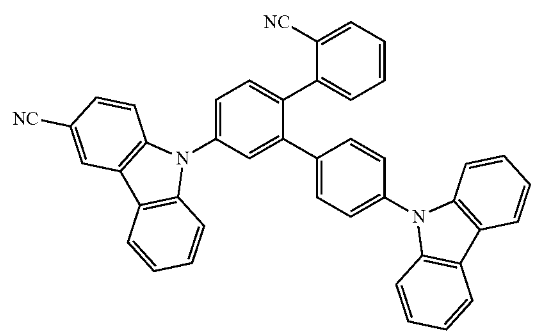

-continued
174
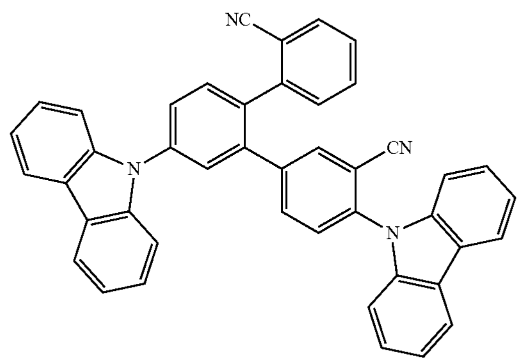
175
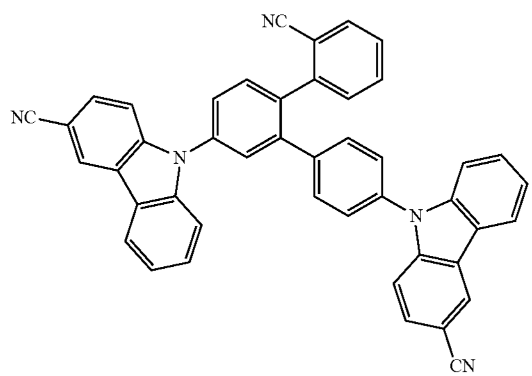
176
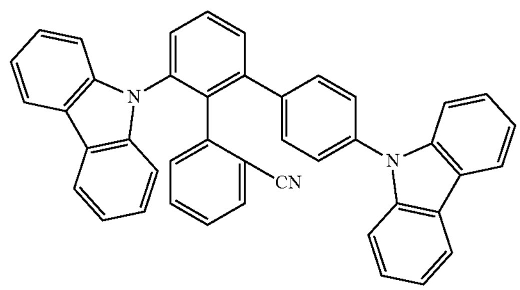
177
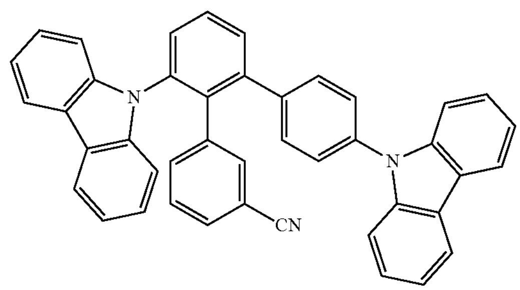
-continued
178
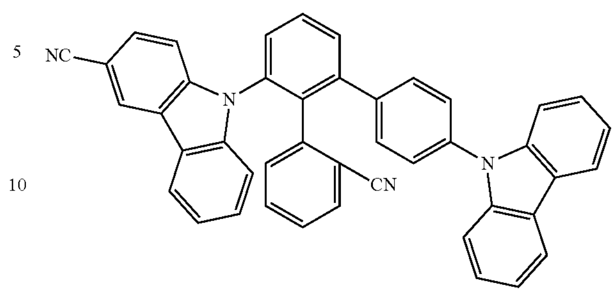
179
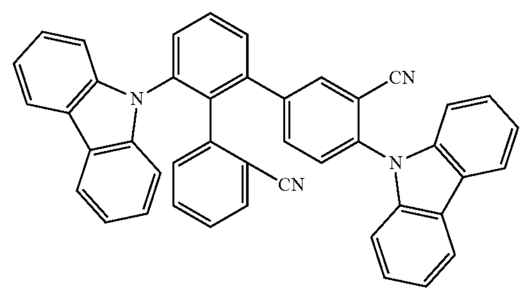
180
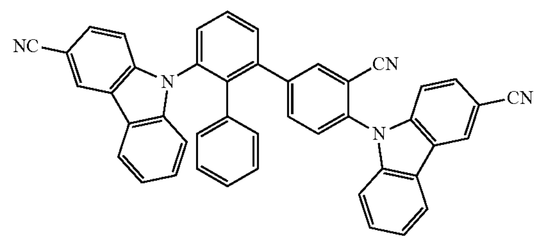
181
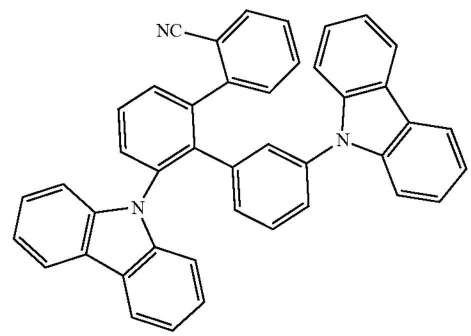

182
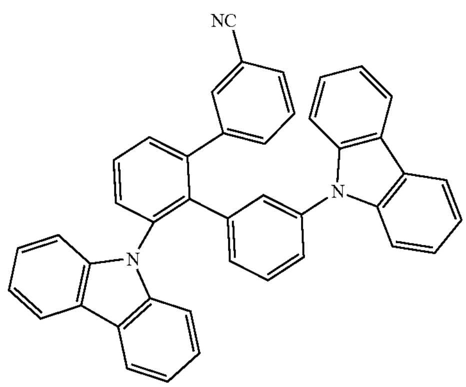
183
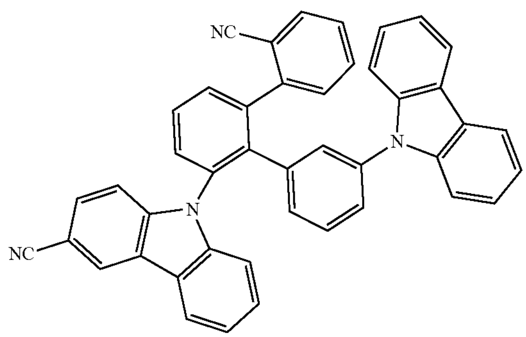
184
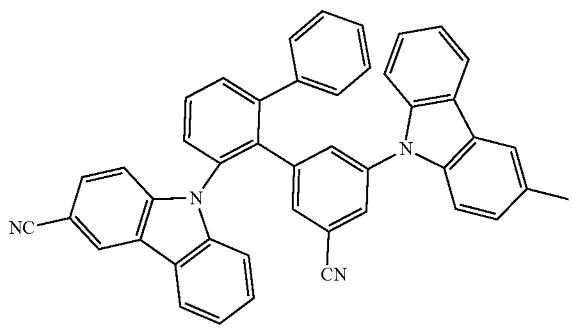
185
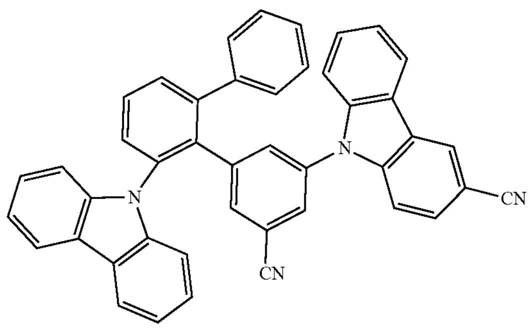
186
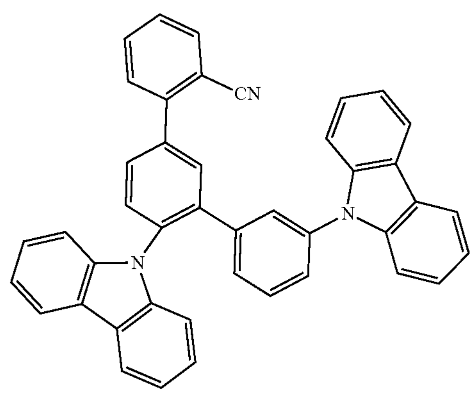
187
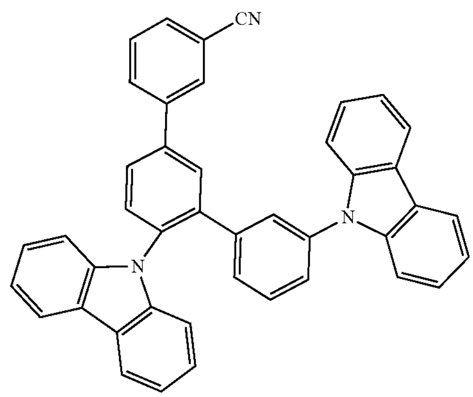
188
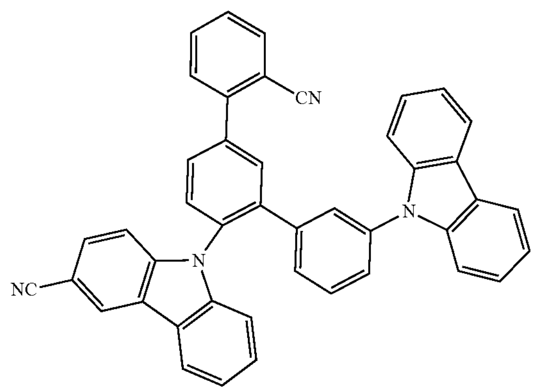
189
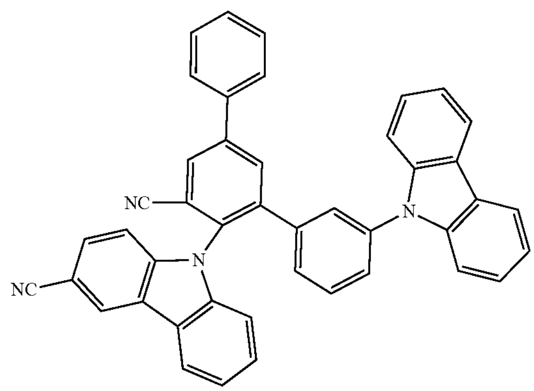

-continued
190
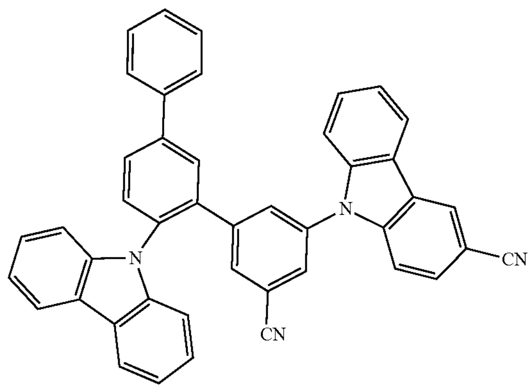
191
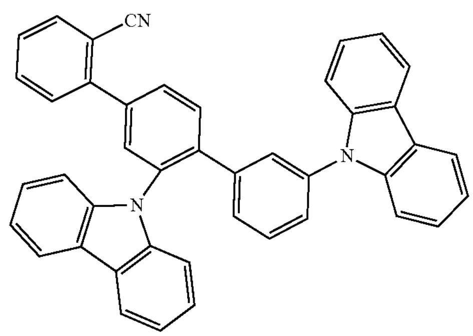
192
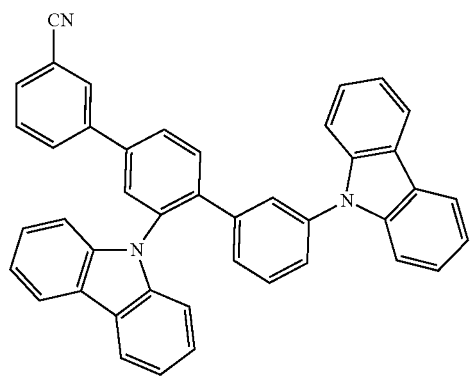
193
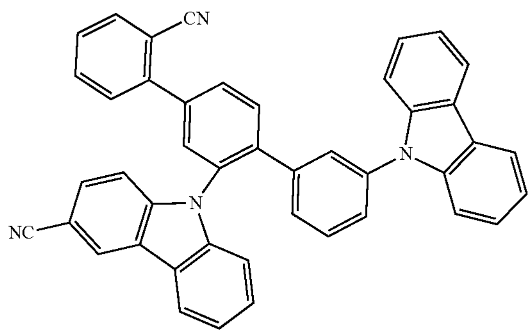
-continued
194
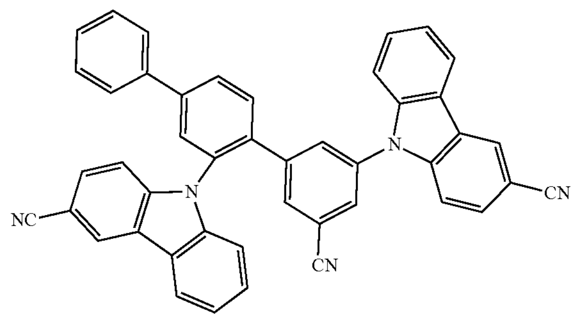
195
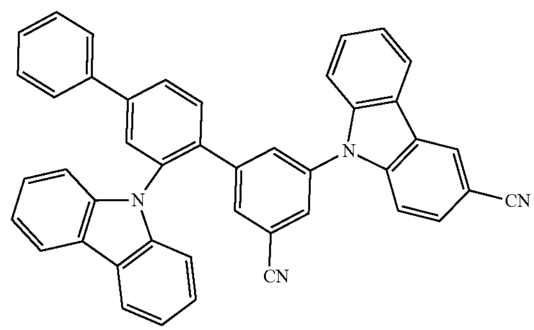
196
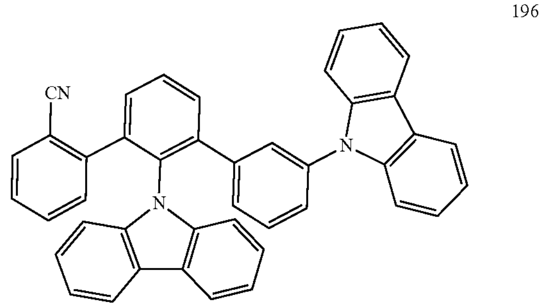
197
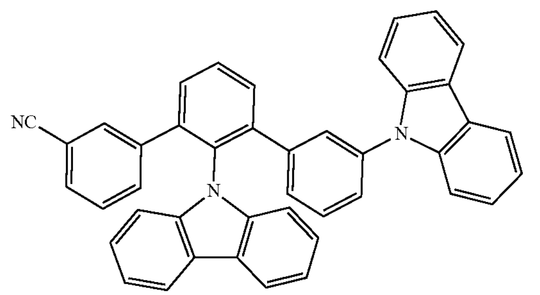
198
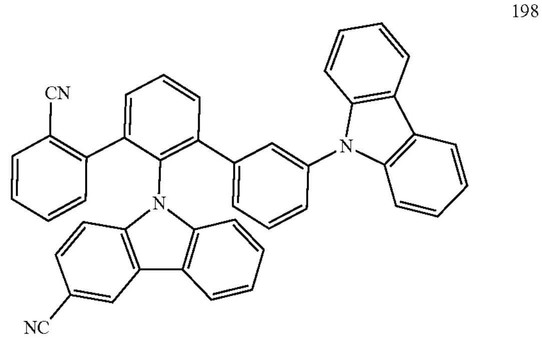

-continued
199
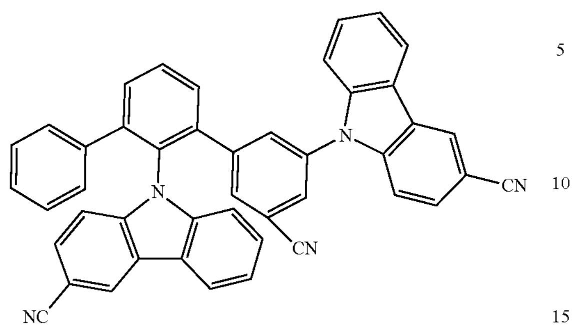
200
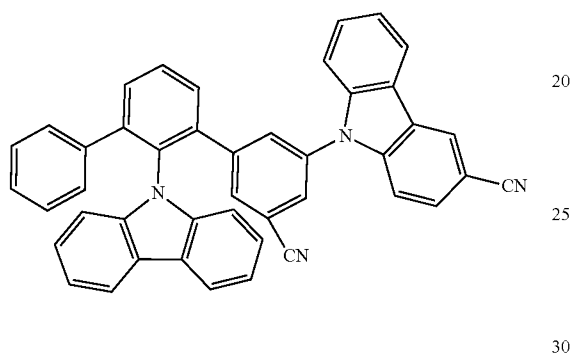
201
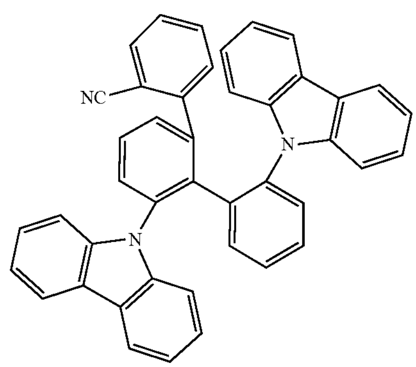
202
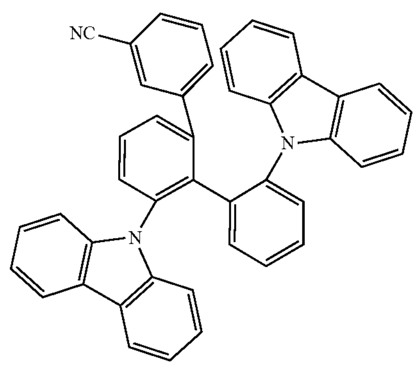
-continued
203
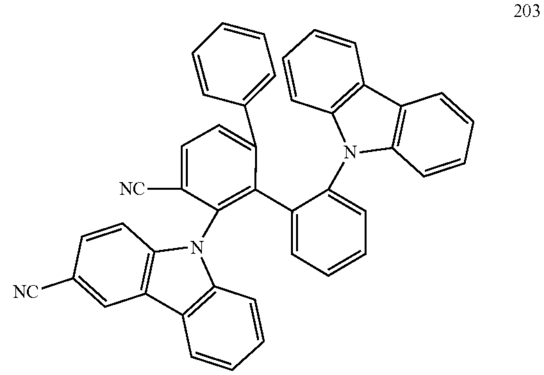
204
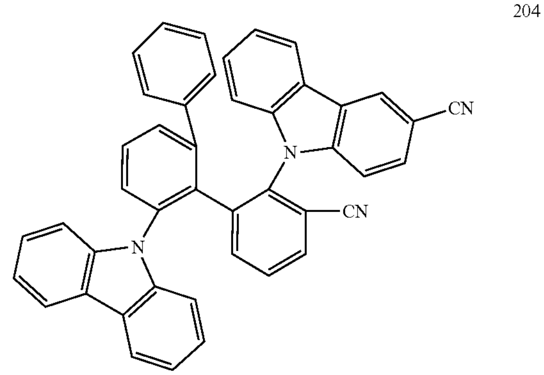
205
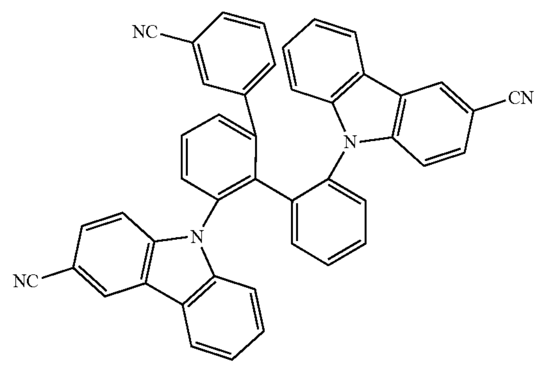
206
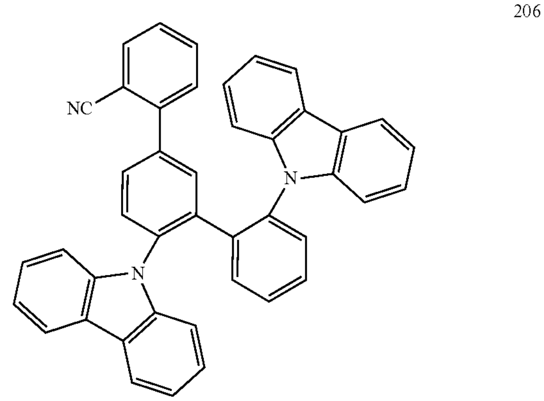

-continued
207
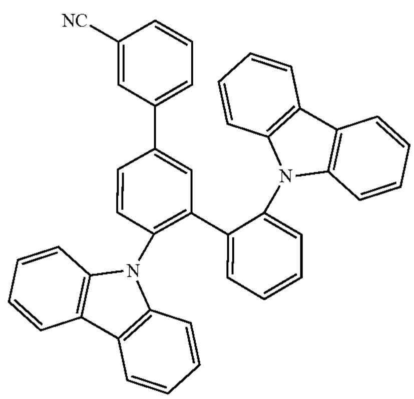
208
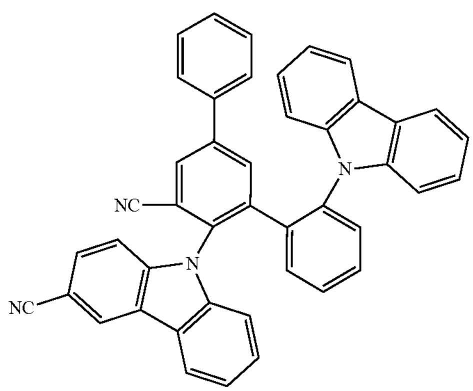
209
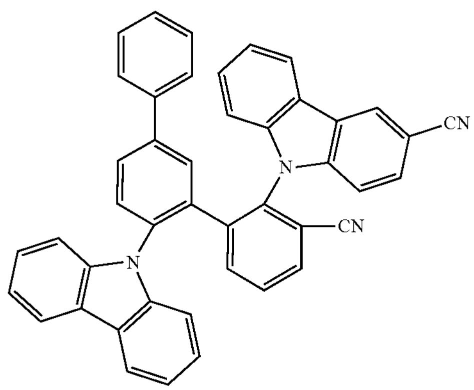
210
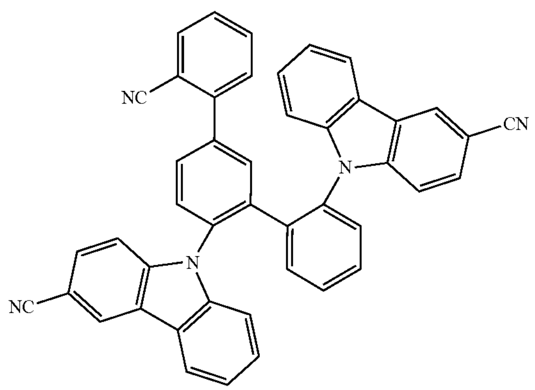
-continued
211
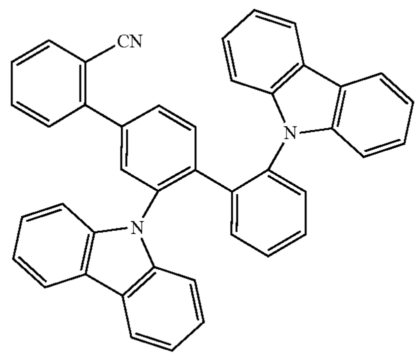
212
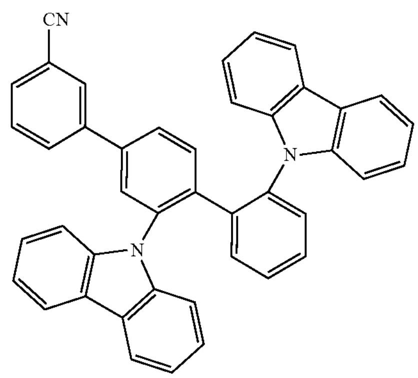
213
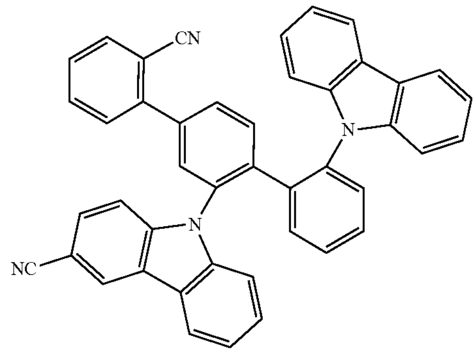
214
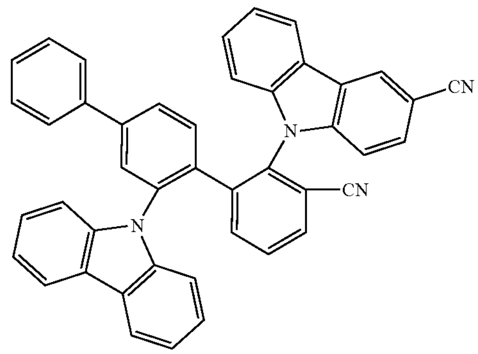

-continued
215
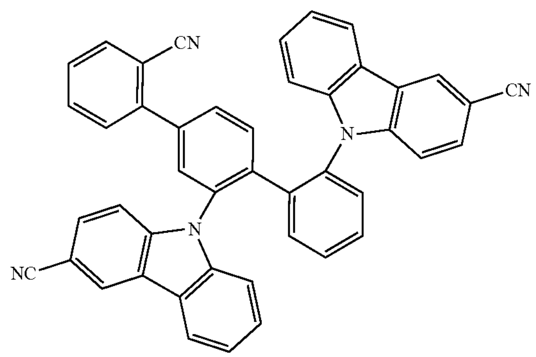
216
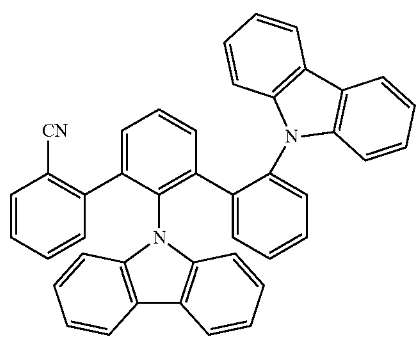
217
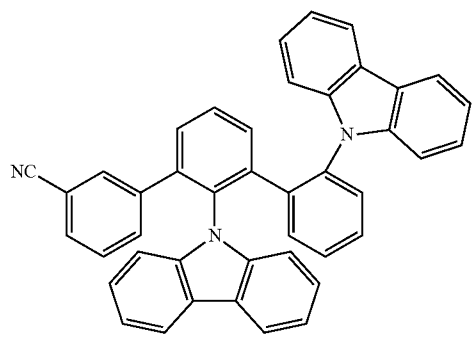
218
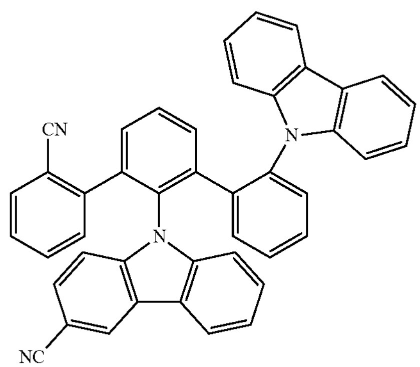
-continued
219
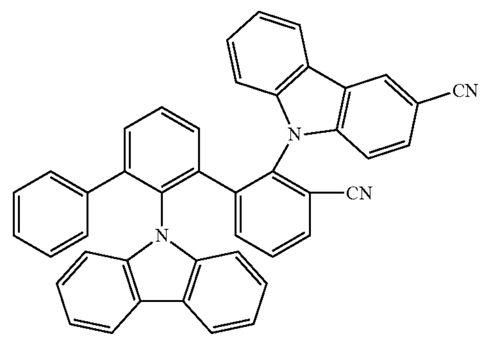
220
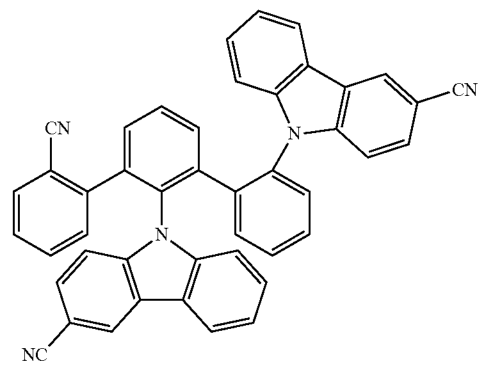
221
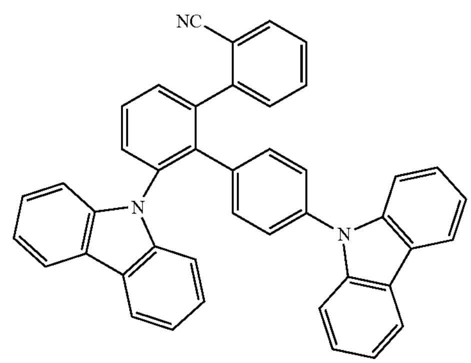
222
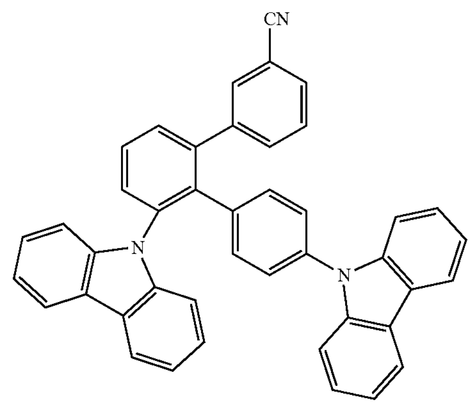

-continued
223
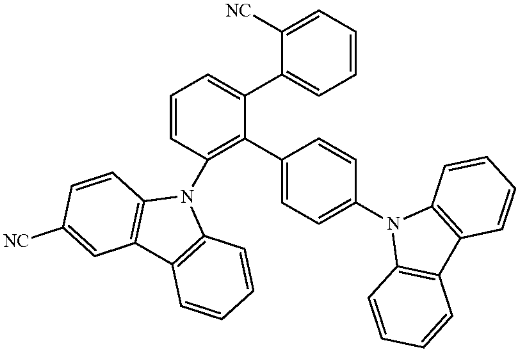
224
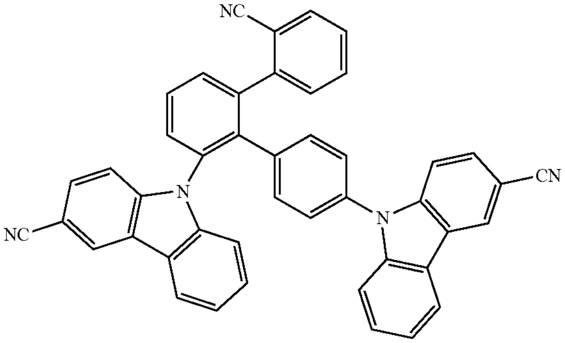
225
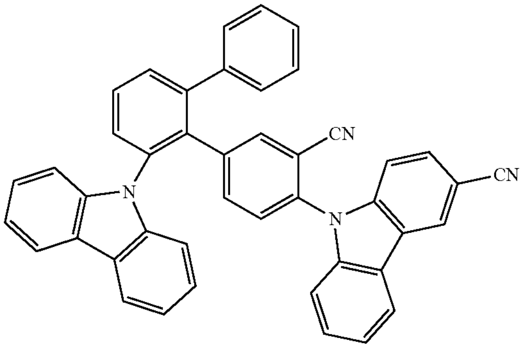
226
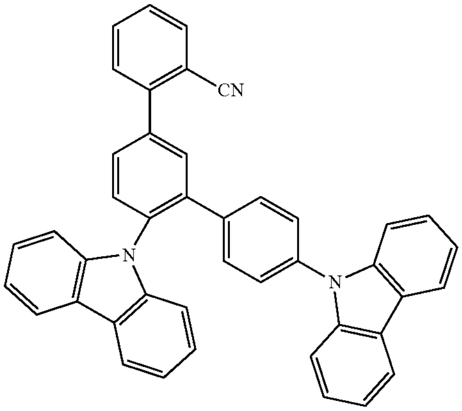
-continued
227
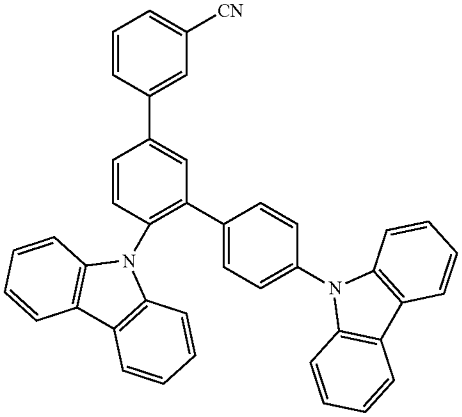
228
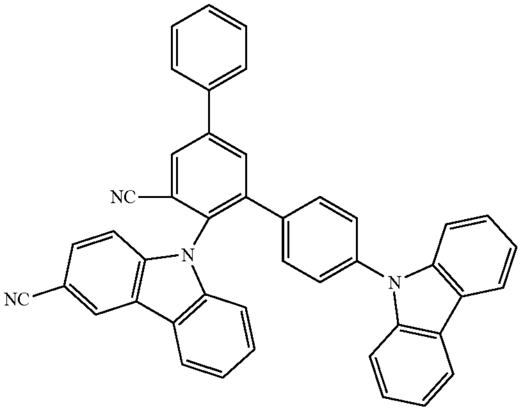
229
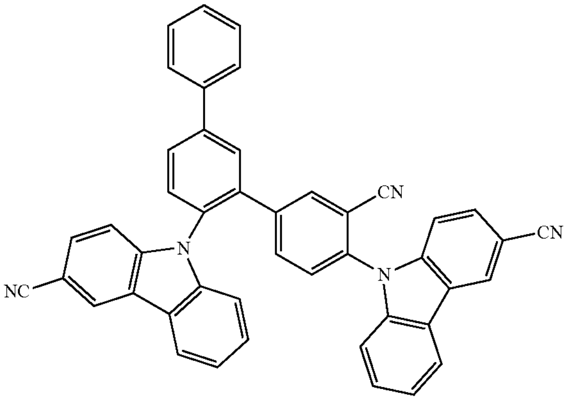

-continued
230
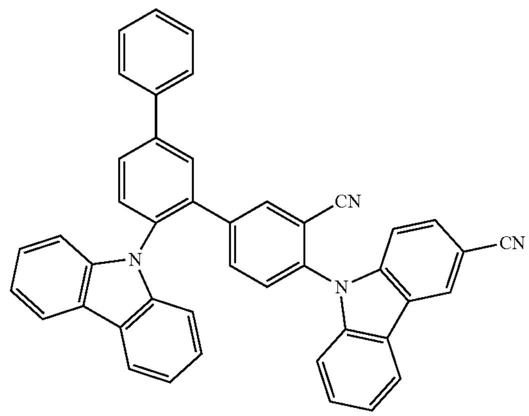
231
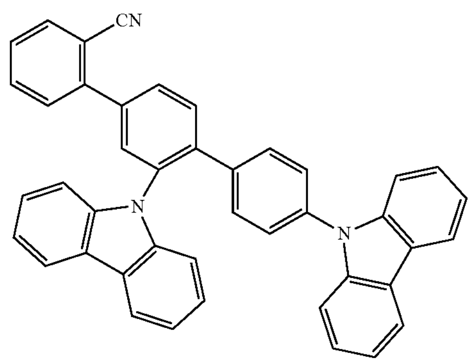
232
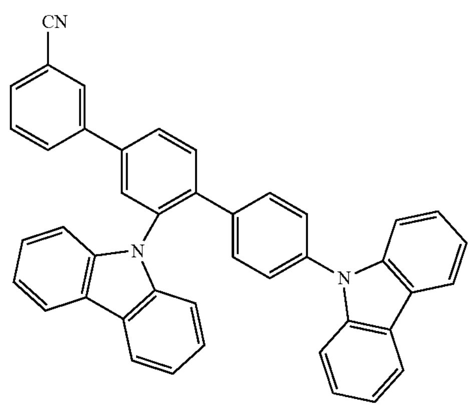
233
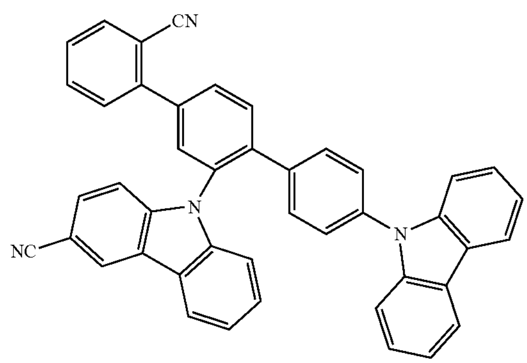
-continued
234
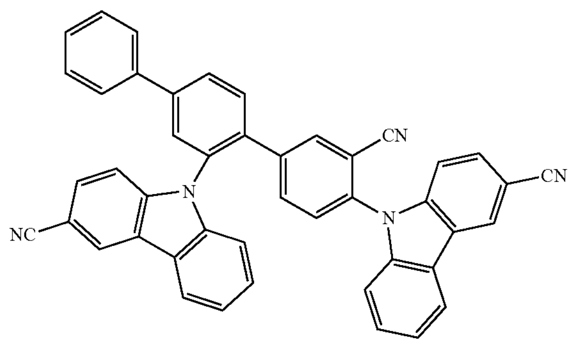
235
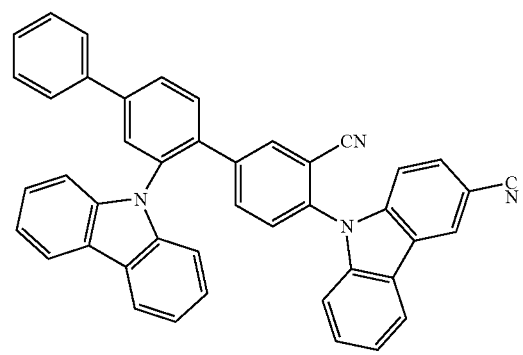
236
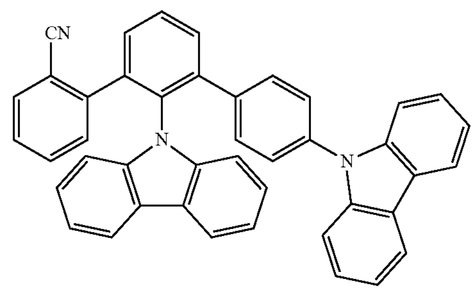
237
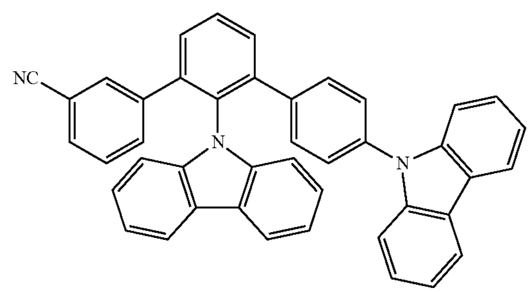
238
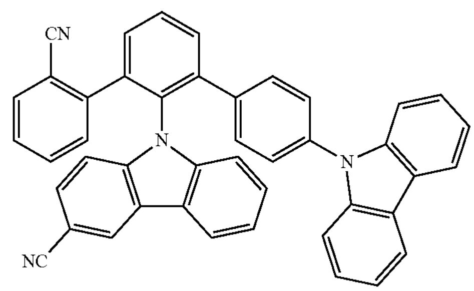

-continued
239
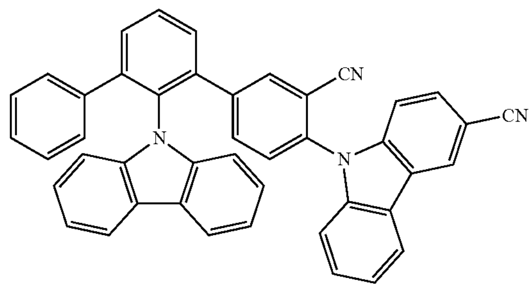
240
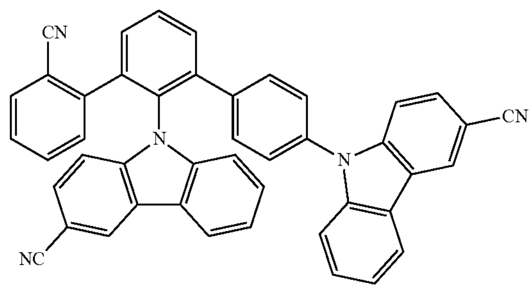
241
242
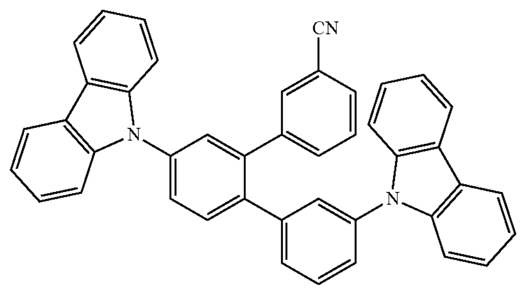
243
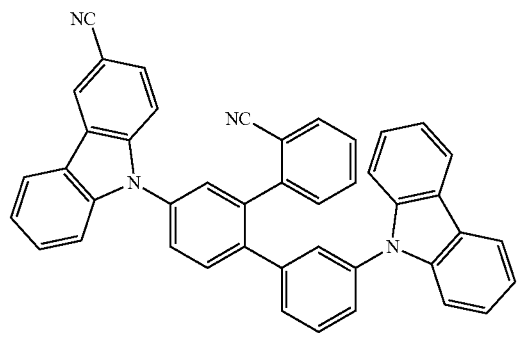
-continued
244
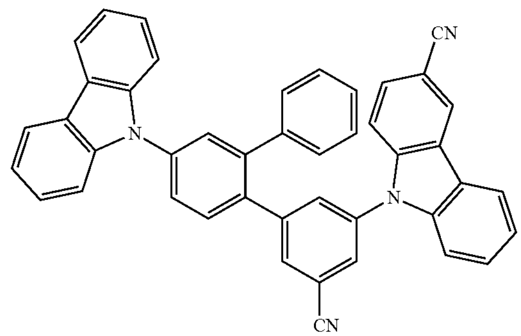
245
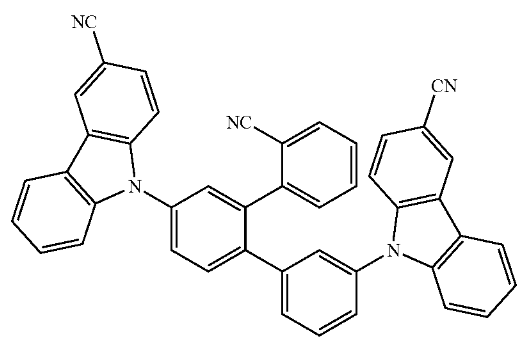
246
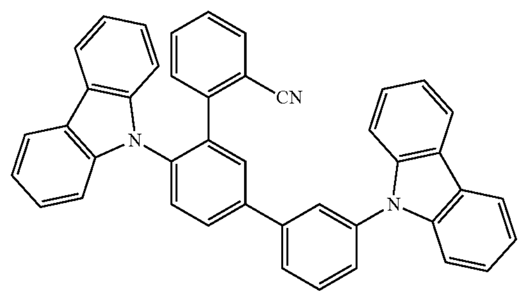
247
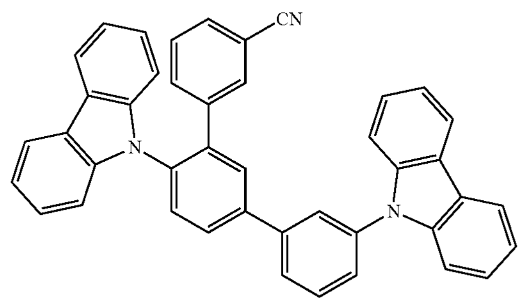

248
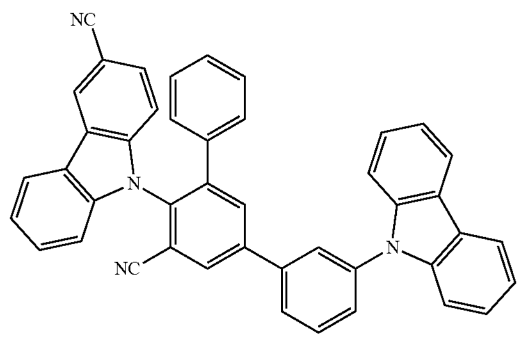
249
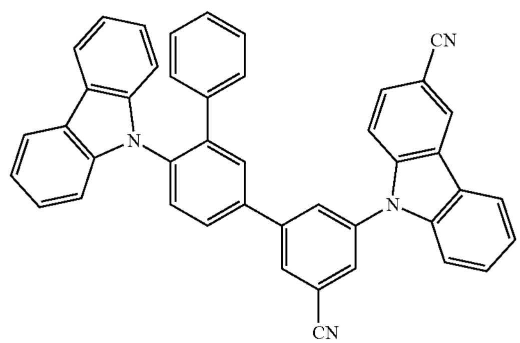
250
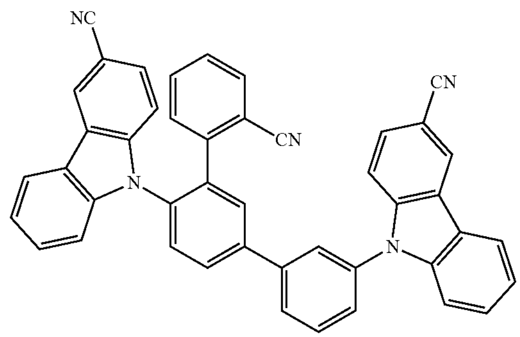
251
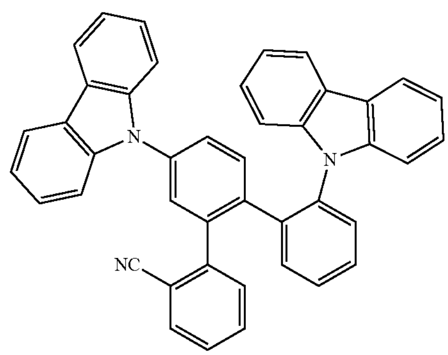
252
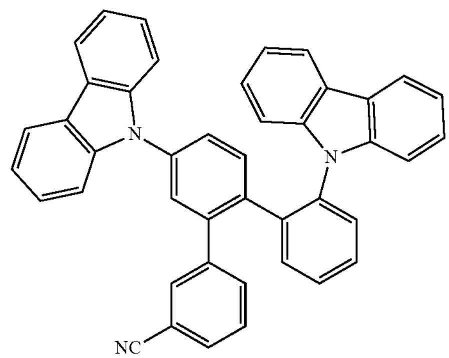
253
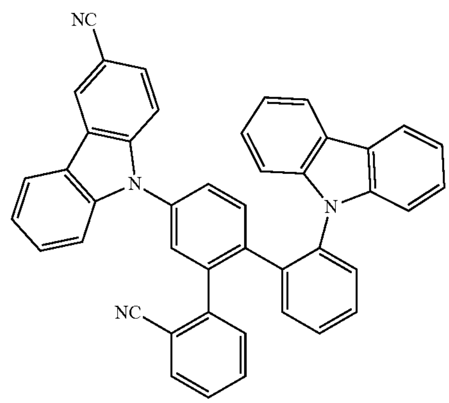
254
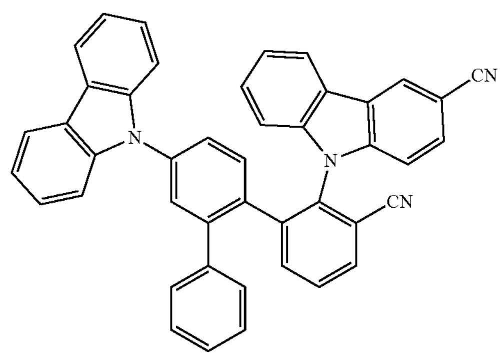
255
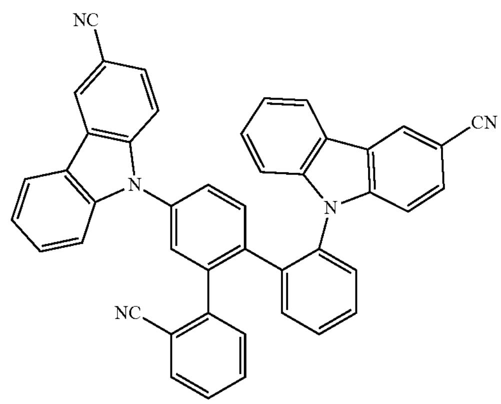

-continued
256
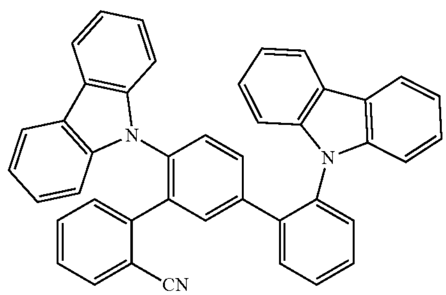
257
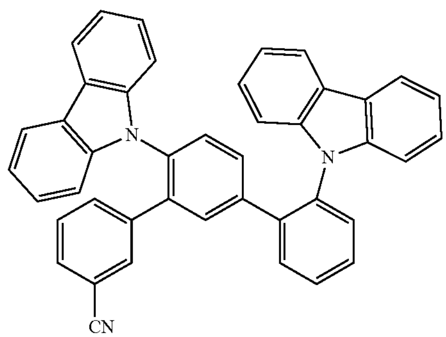
258
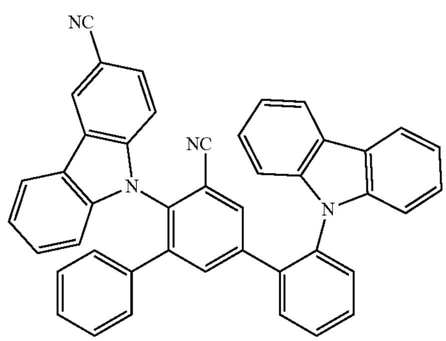
259
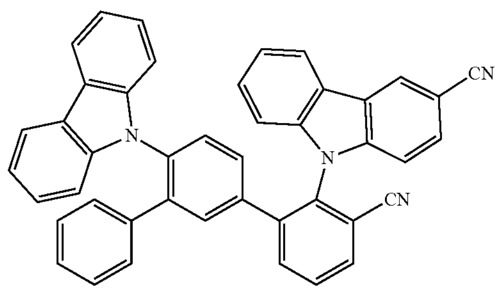
-continued
260
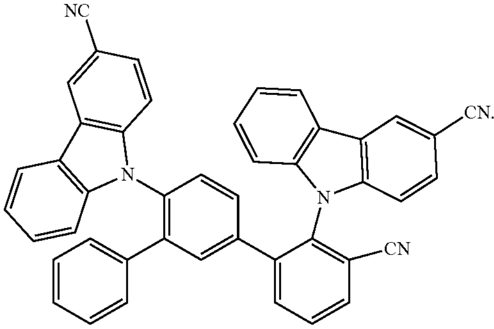
In one or more embodiments, the electron-transporting host may include DPEPO or TSPO1:
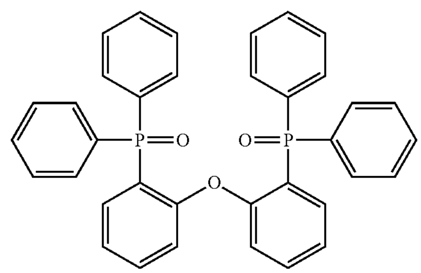
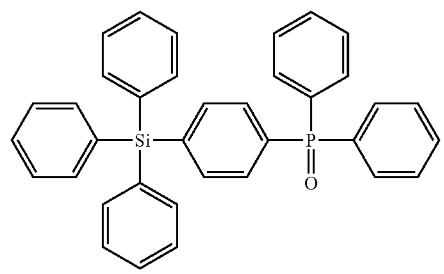
In one or more embodiments, the hole-transporting host may be compounds of Group HH1, but embodiments of the present disclosure are not limited thereto:

-continued
Group HH1
H-H1
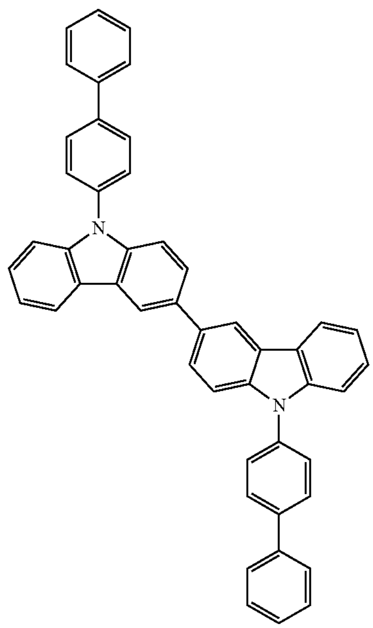
H-H2
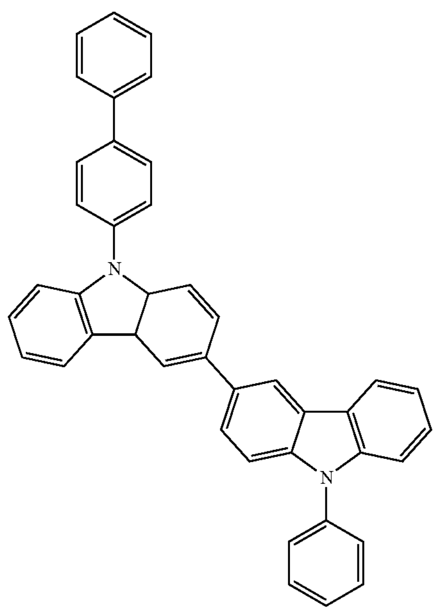
H-H3
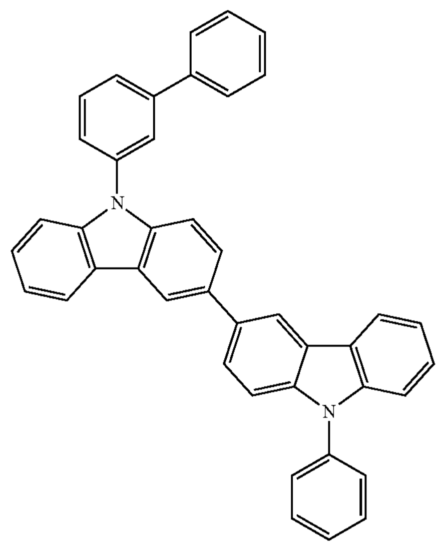
H-H4
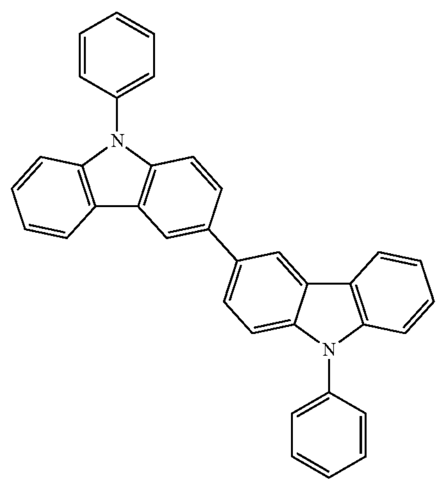
H-H5
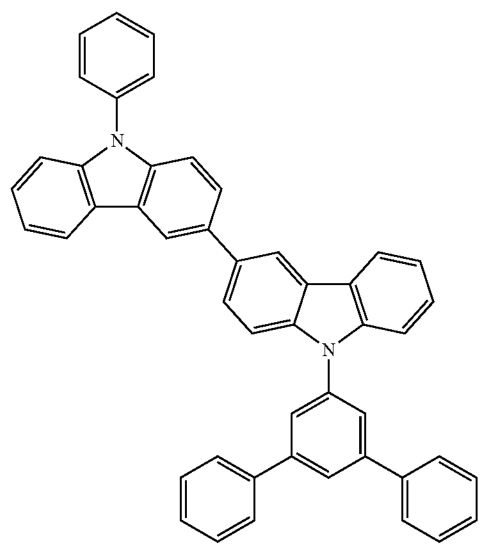

-continued
H-H6
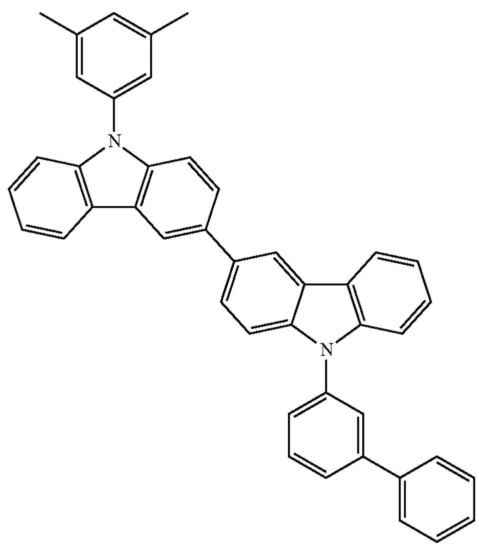
H-H7
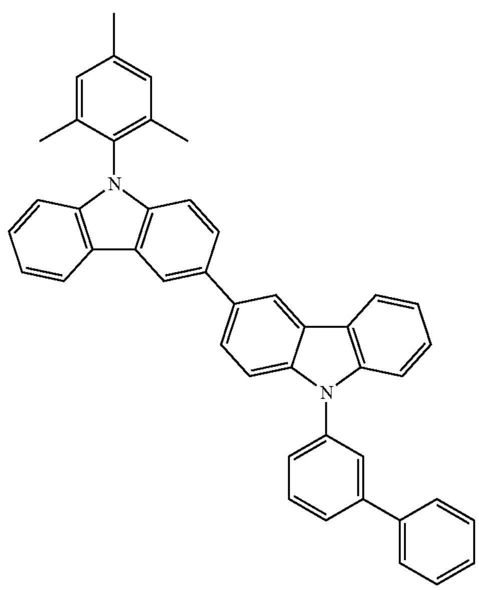
-continued
H-H8
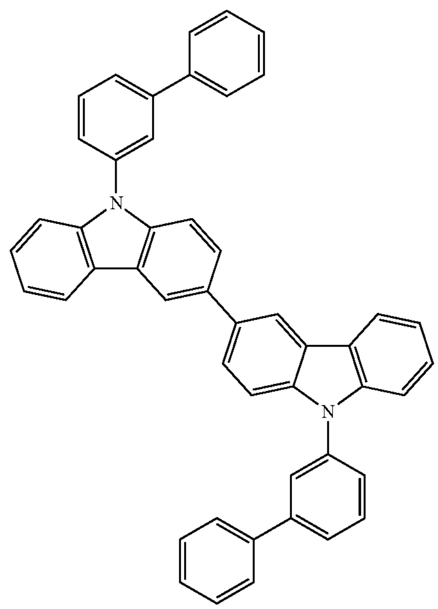
H-H9
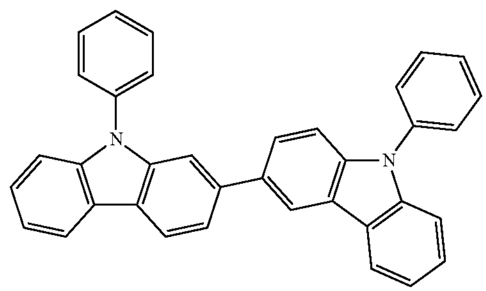
H-H10
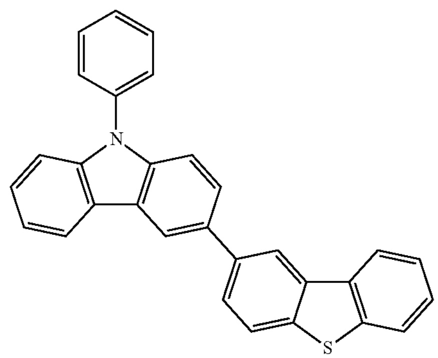
H-H11
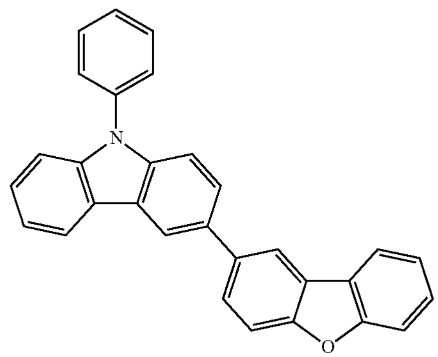

-continued
H-H12
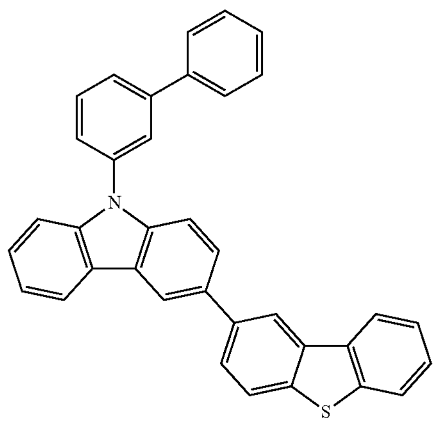
H-H13
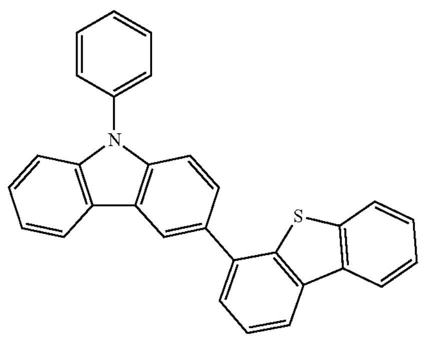
H-H14
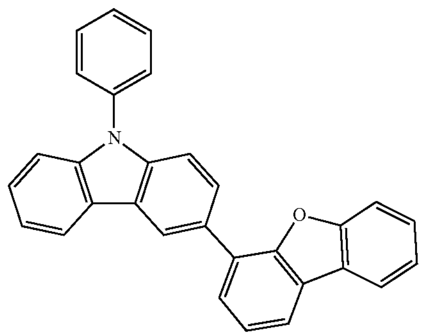
H-H15
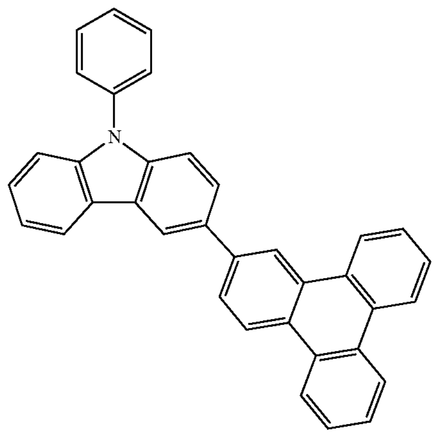
-continued
H-H16
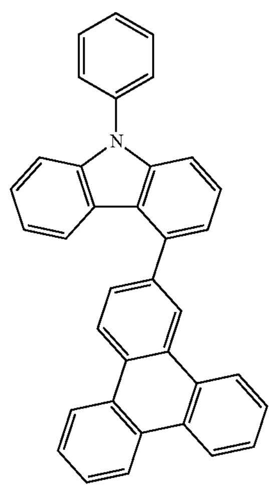
H-H17
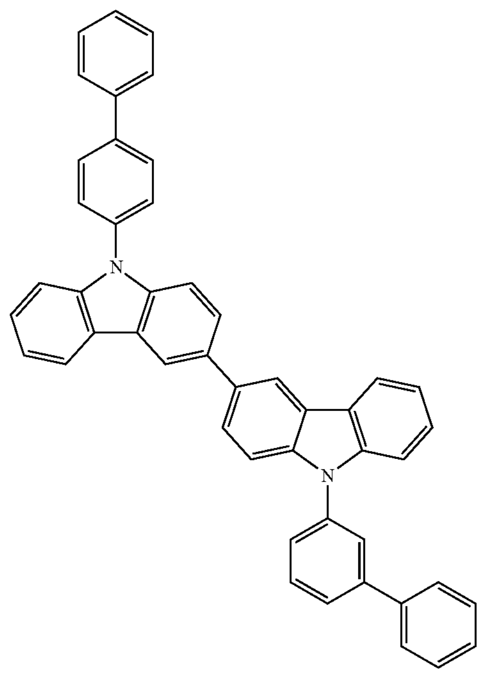
H-H18
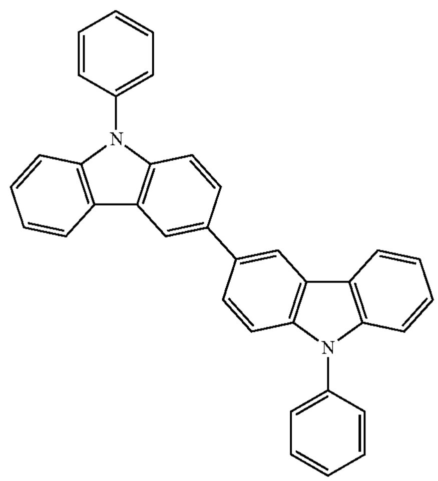

-continued
H-H19
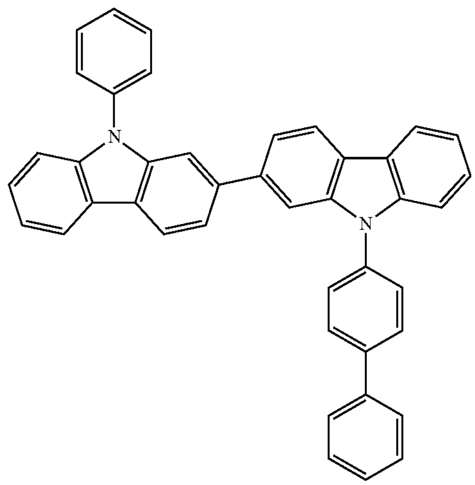
H-H20
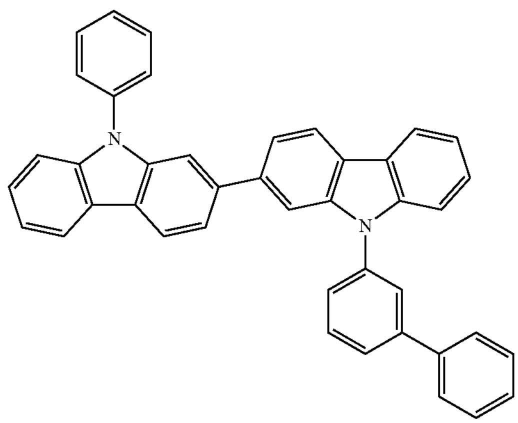
H-H21
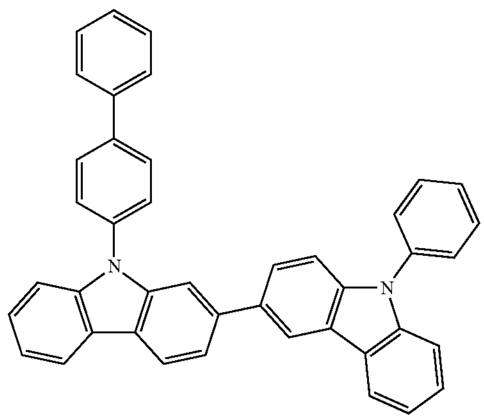
-continued
H-H22
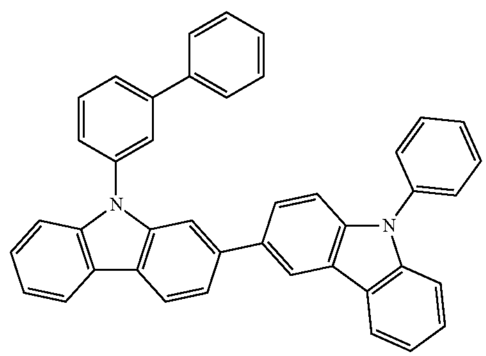
H-H23
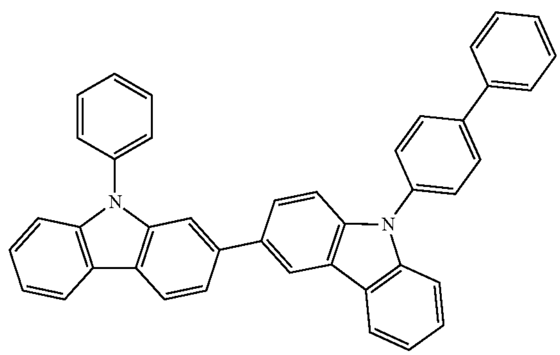
H-H24
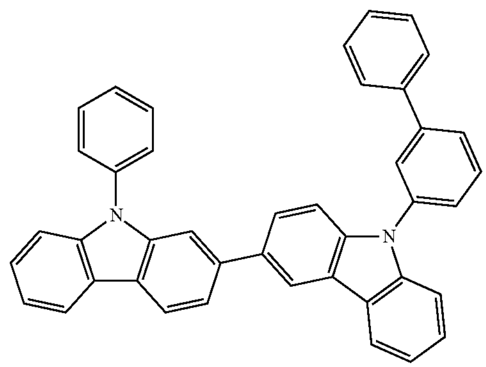
H-H25
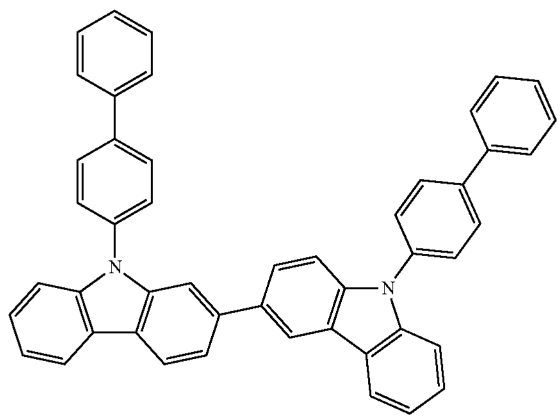

-continued
H-H26
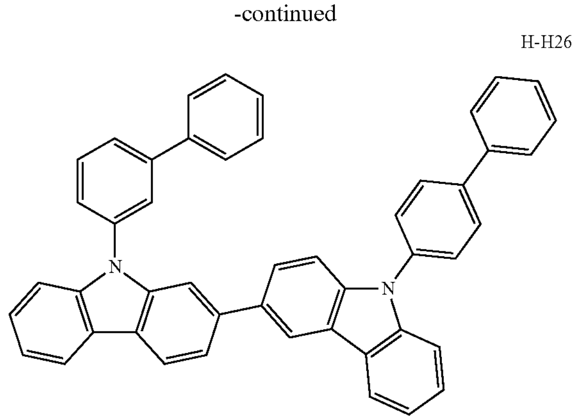
H-H27
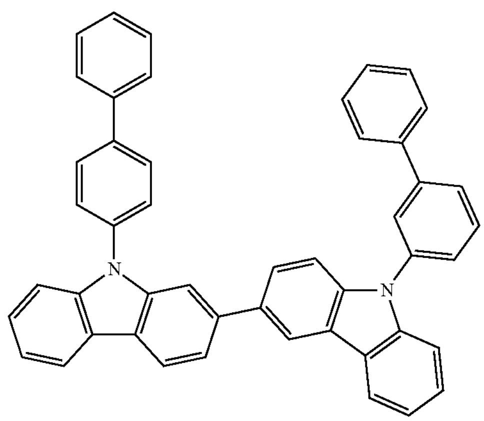
H-H28
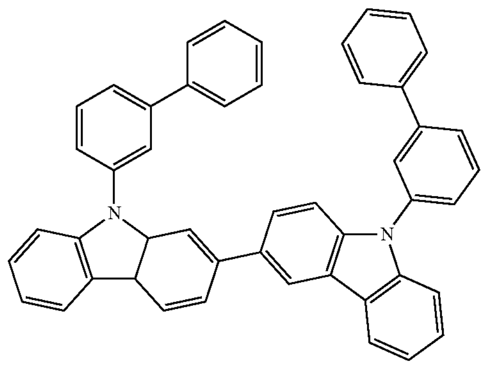
-continued
H-H29
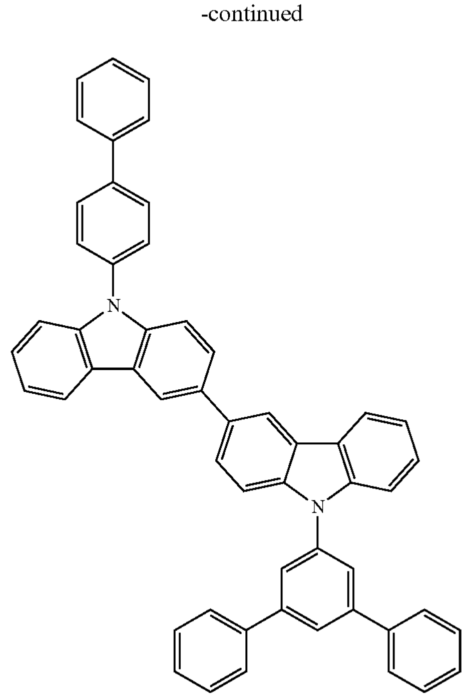
H-H30
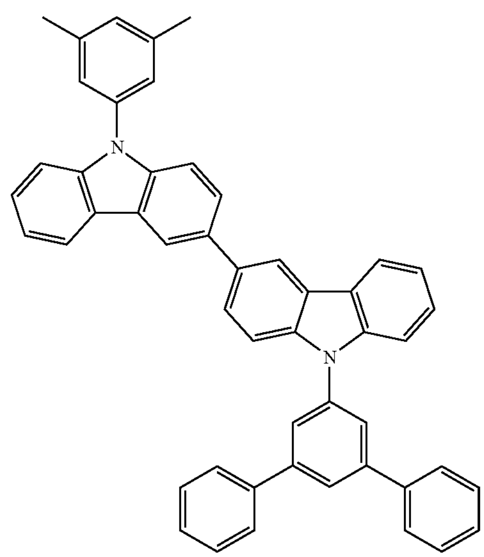

-continued
H-H31
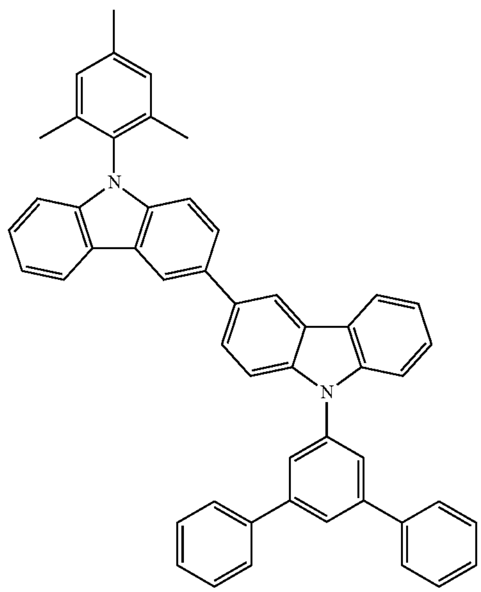
H-H32
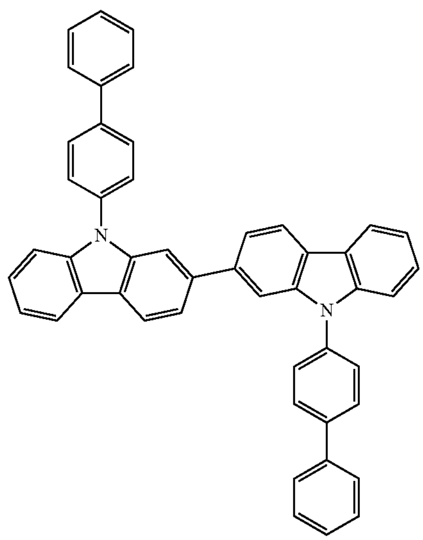
-continued
H-H33
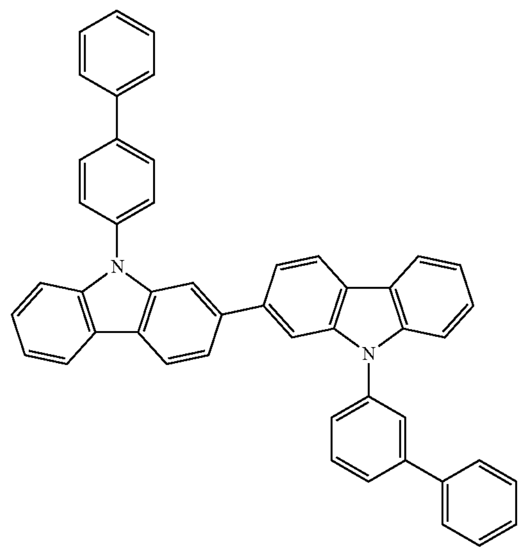
H-H34
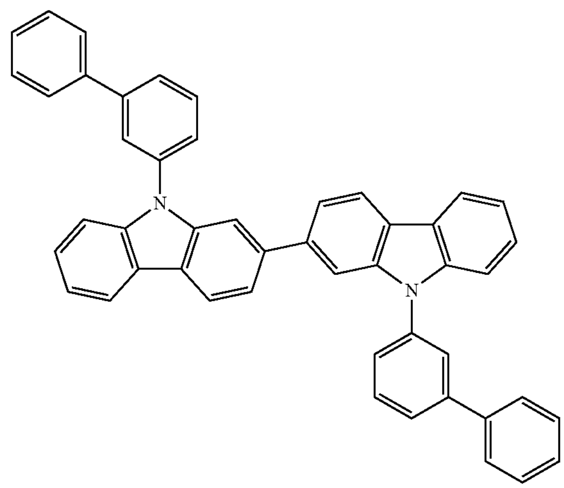
H-H35
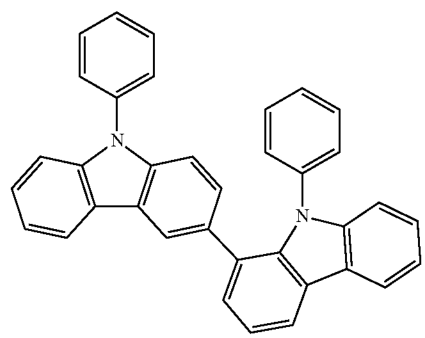

-continued
H-H36
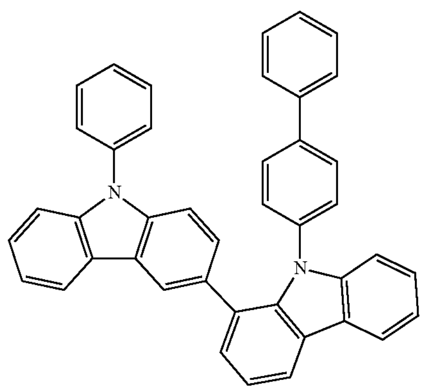
H-H37
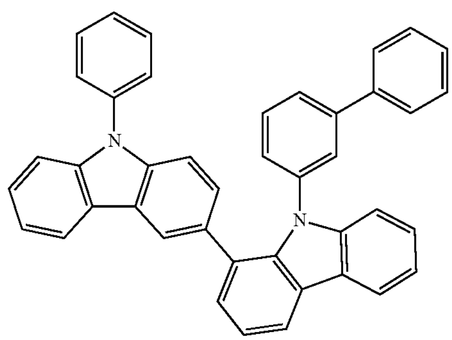
H-H38
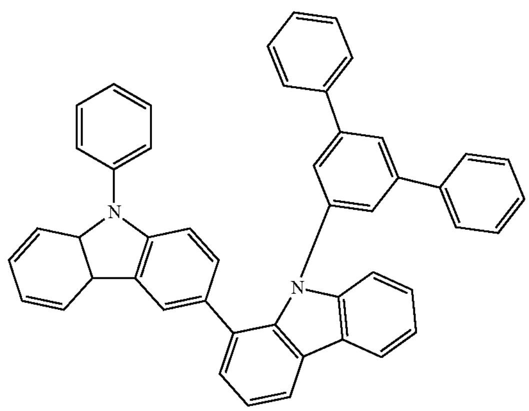
H-H39
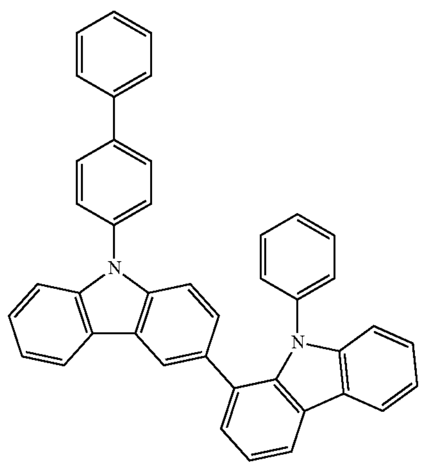
-continued
H-H40
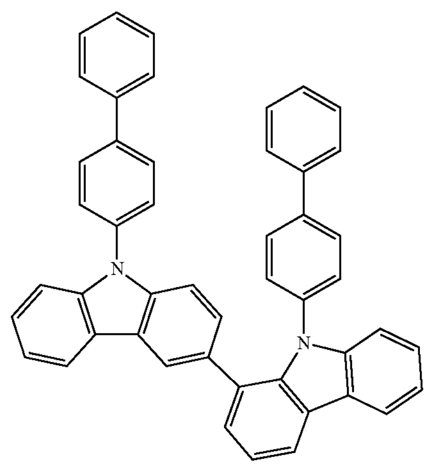
H-H41
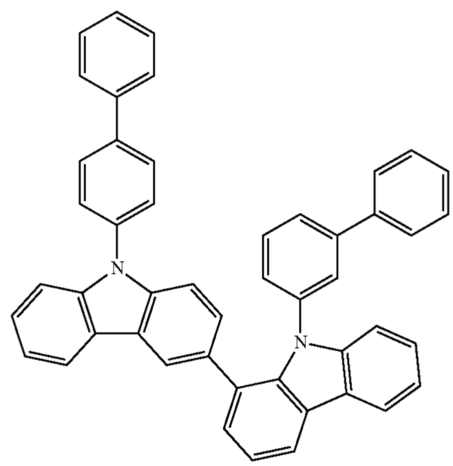
H-H42
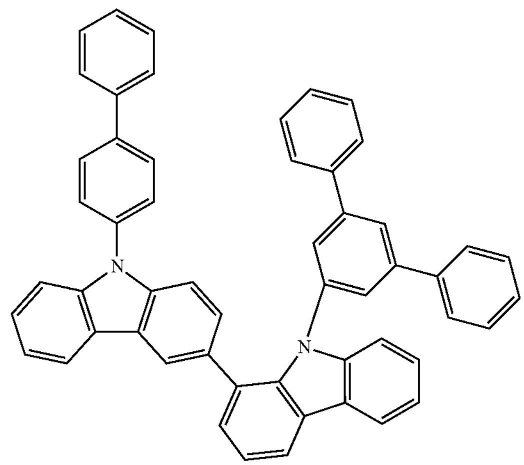

-continued
H-H43
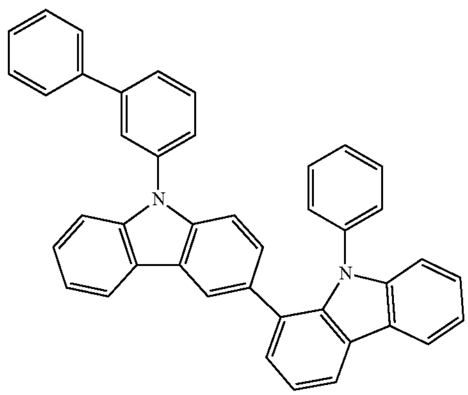
H-H44
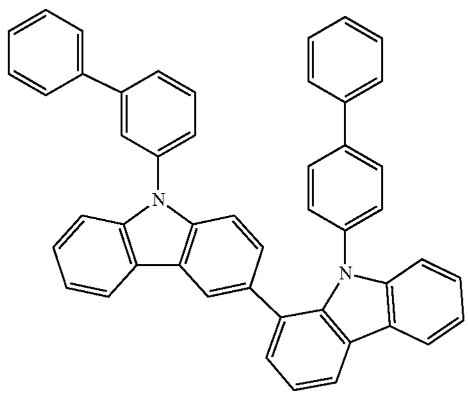
H-H45
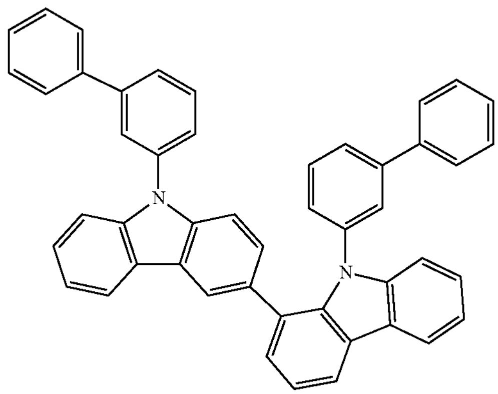
H-H46
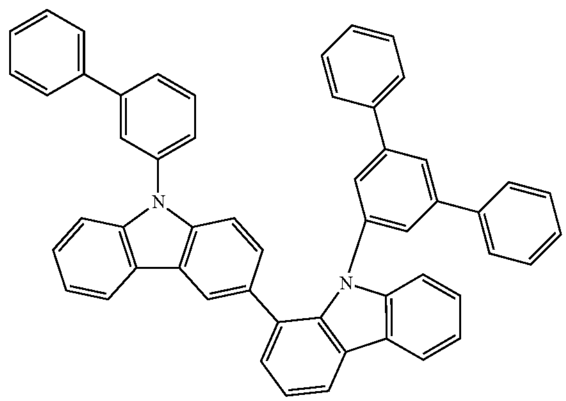
-continued
H-H47
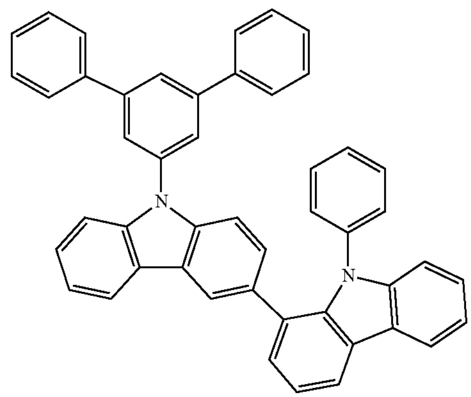
H-H48
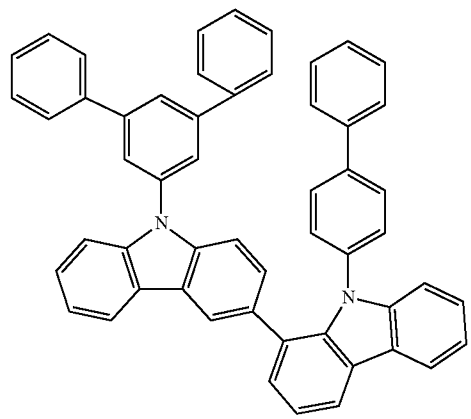
H-H49
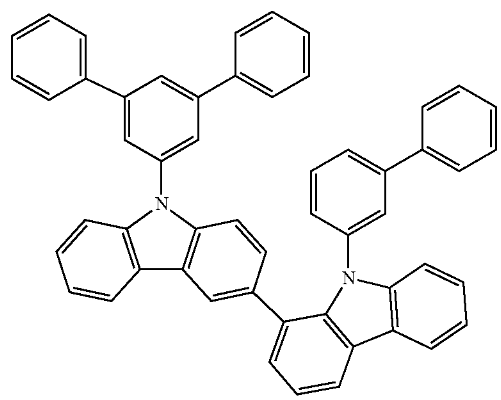

H-H50
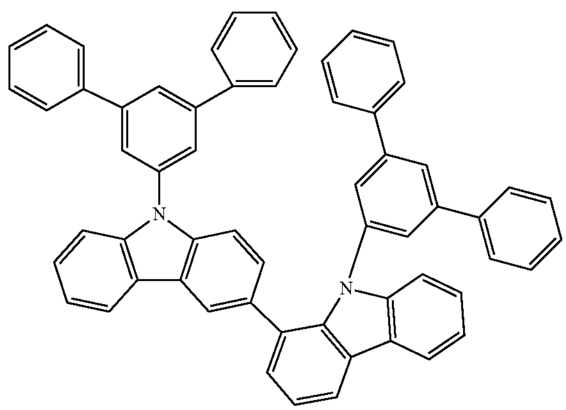
H-H51
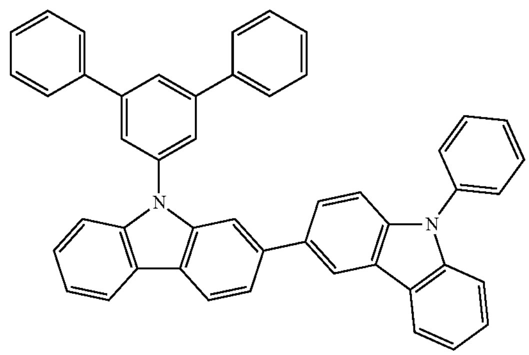
H-H52
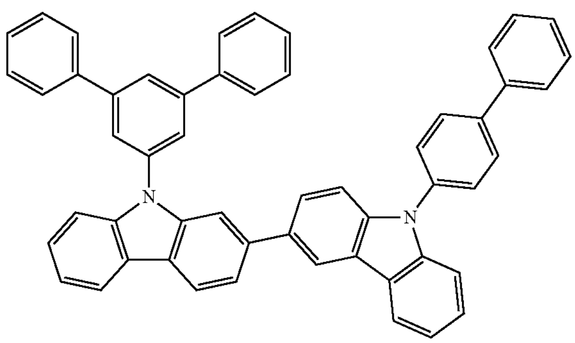
H-H53
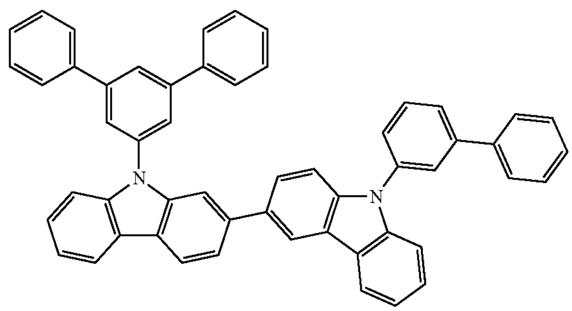
H-H54
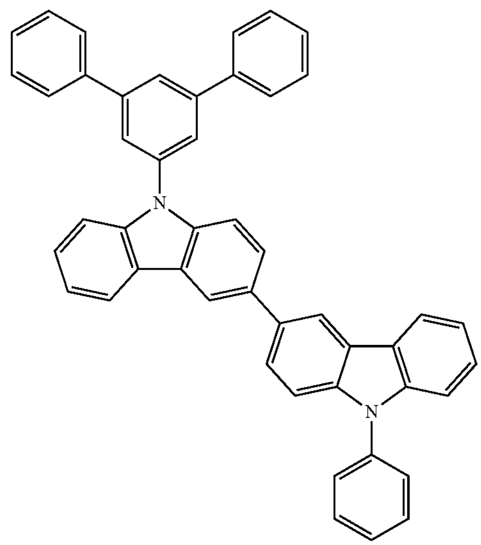
H-H55
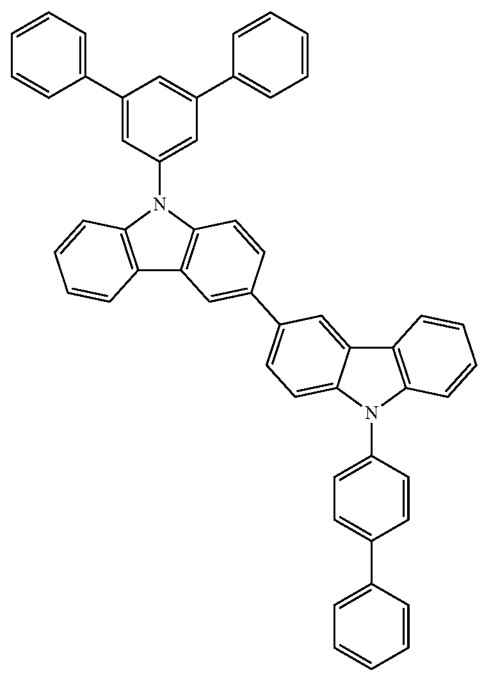

-continued
H-H56
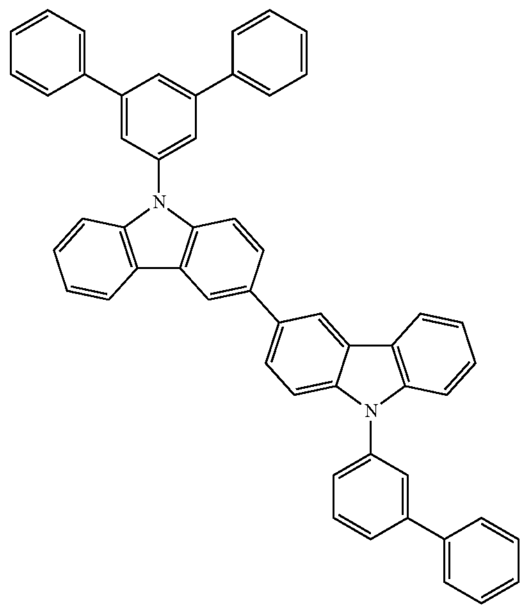
H-H57
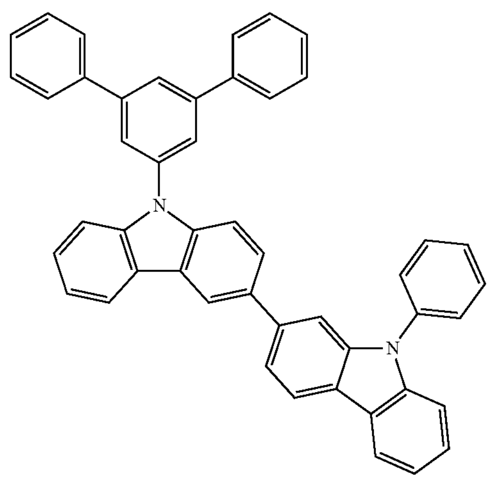
H-H58
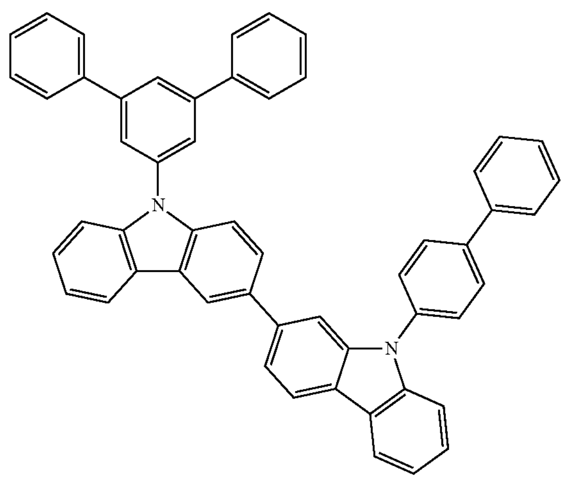
-continued
H-H59
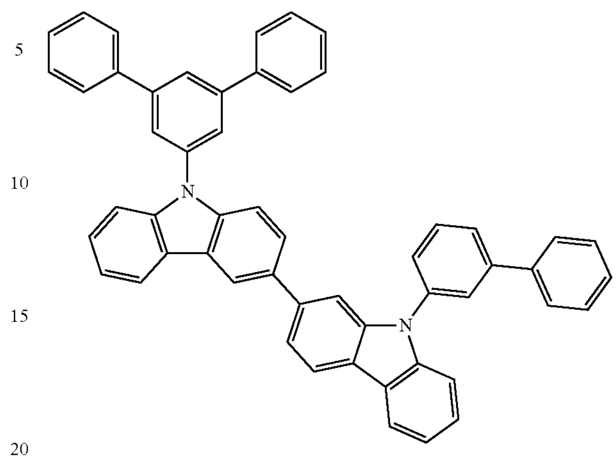
H-H60
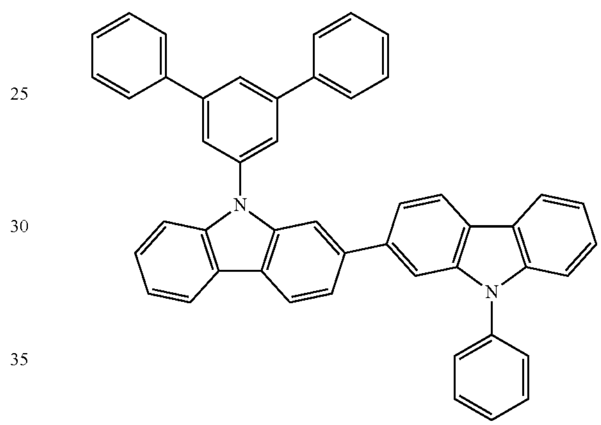
H-H61
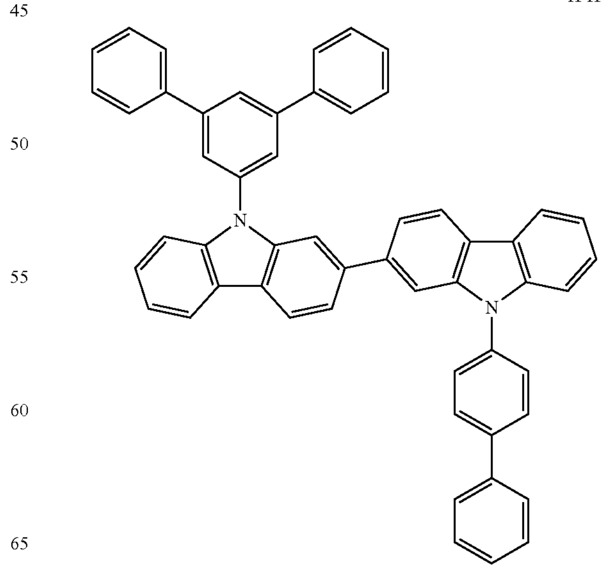

-continued
H-H62
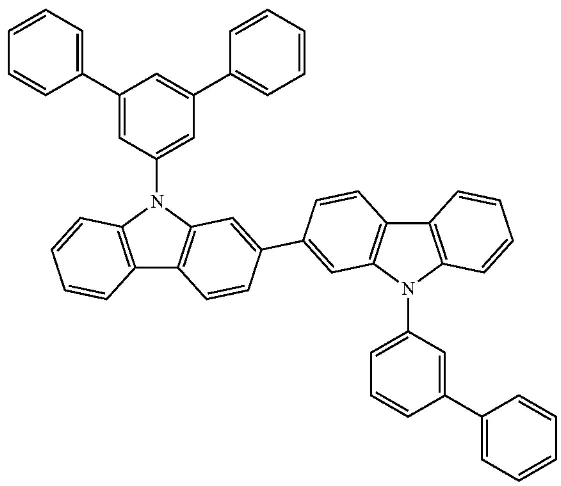
H-H63
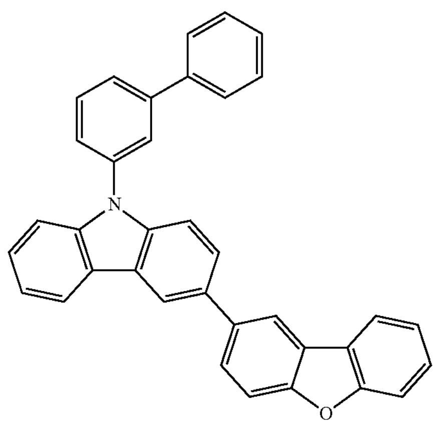
H-H64
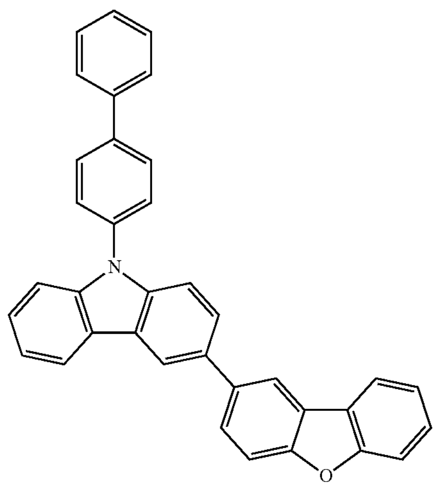
-continued
H-H65
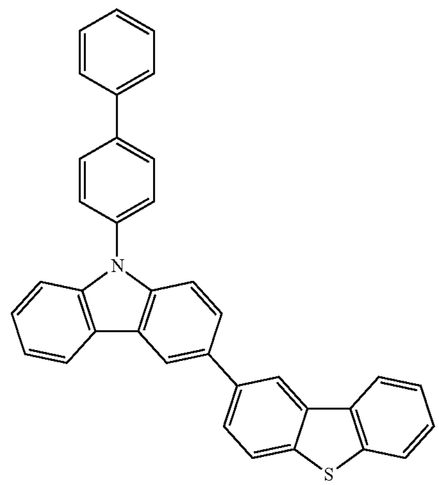
H-H66
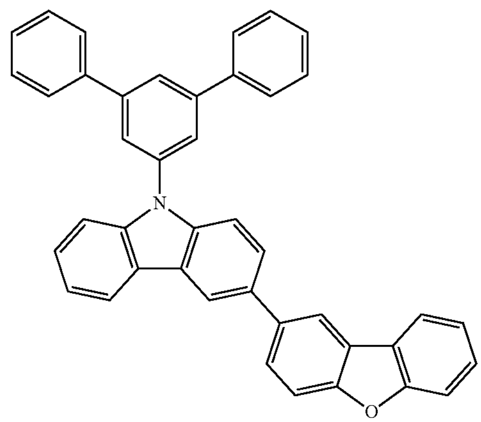
H-H67
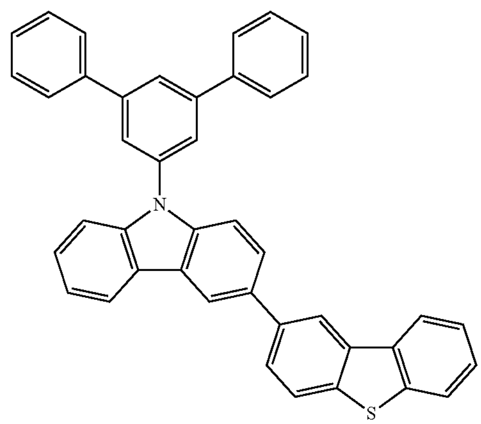

-continued
H-H68
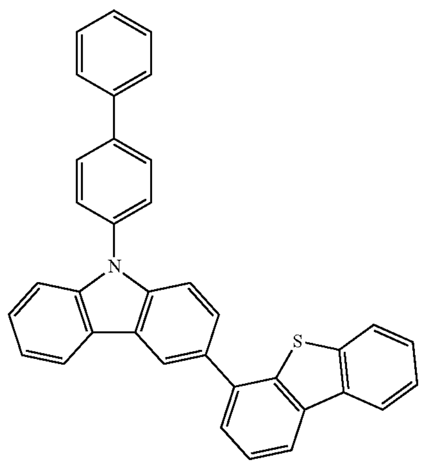
H-H69
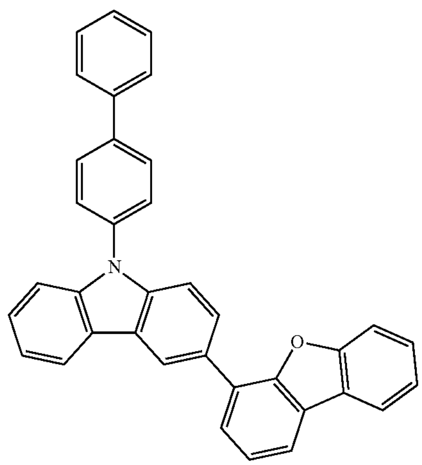
H-H70
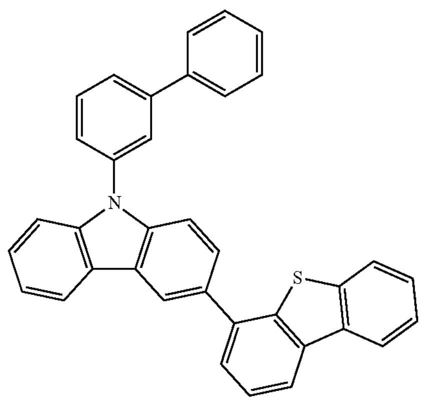
-continued
H-H71
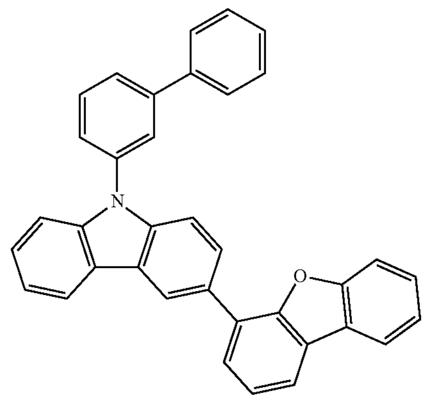
H-H72
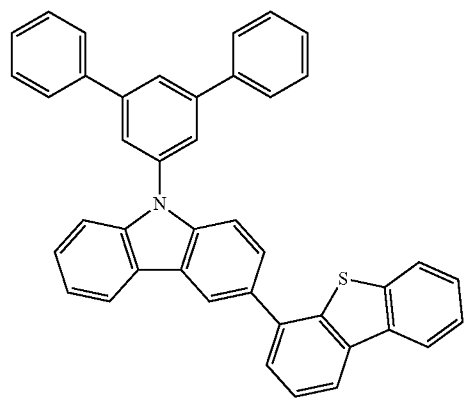
H-H73
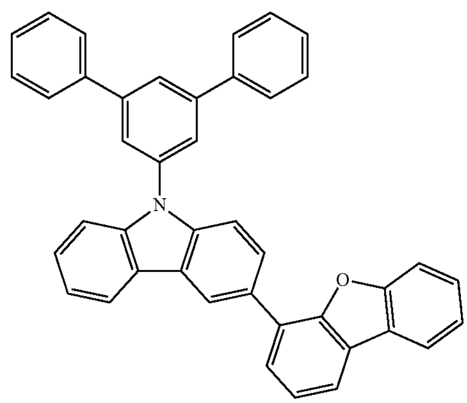
H-H74
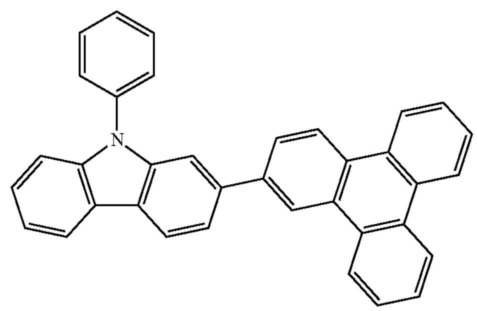

-continued
H-H75
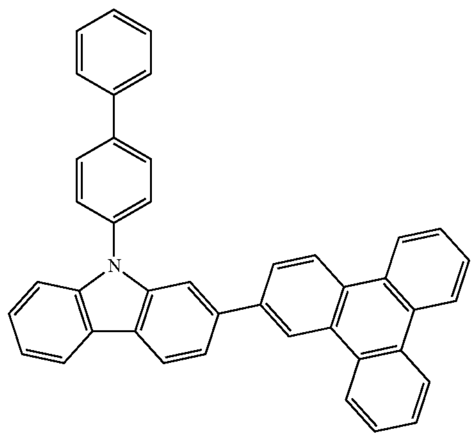
H-H76
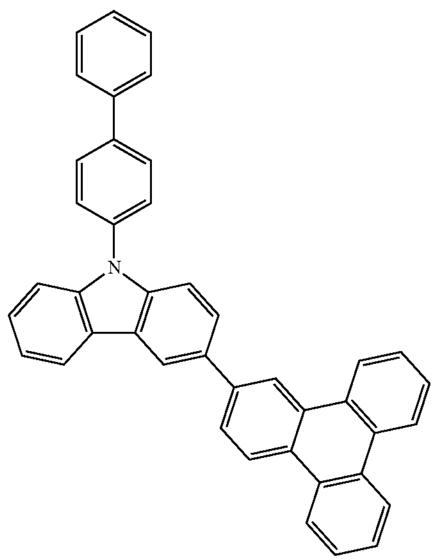
H-H77
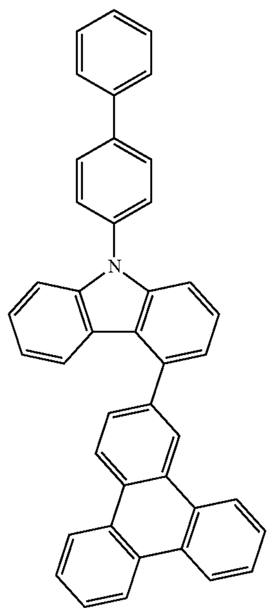
-continued
H-H78
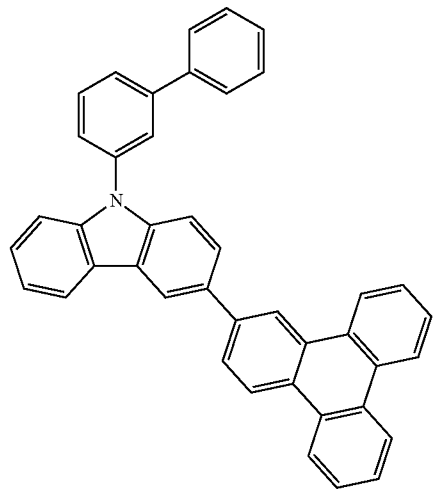
H-H79
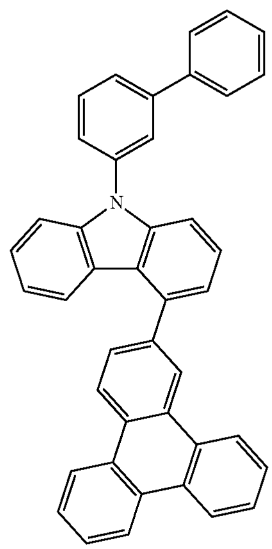
H-H80
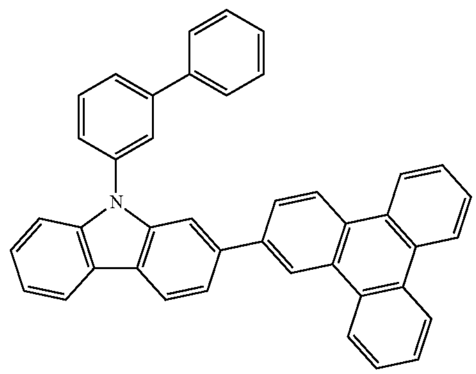

-continued
H-H81
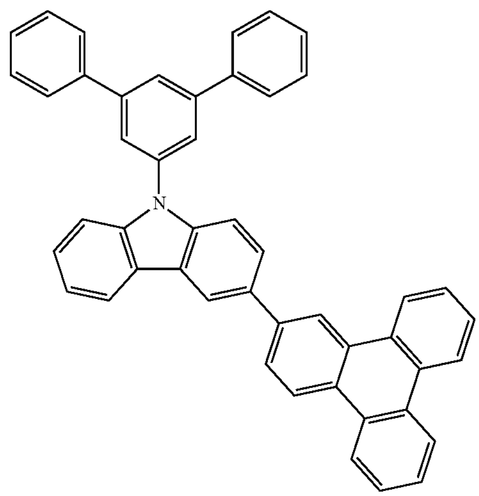
H-H82
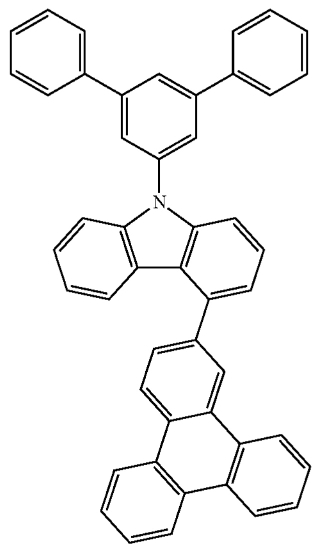
H-H83
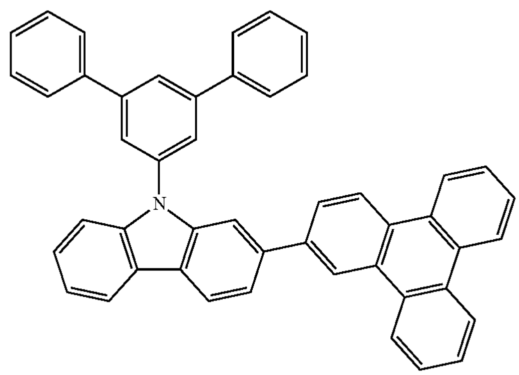
-continued
H-H84
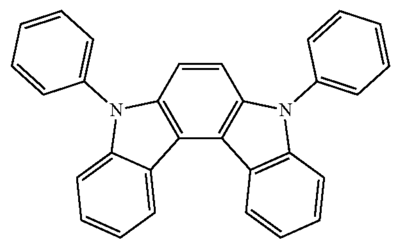
H-H85
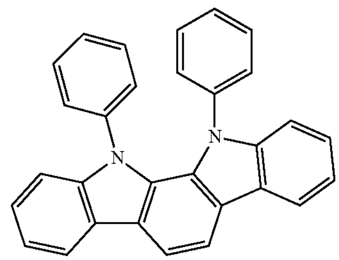
H-H86
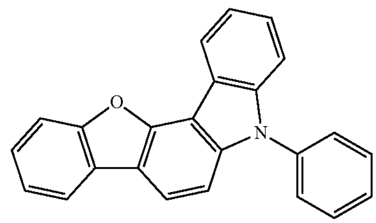
H-H87
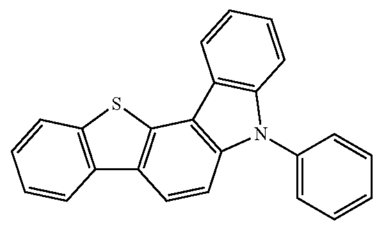
H-H88
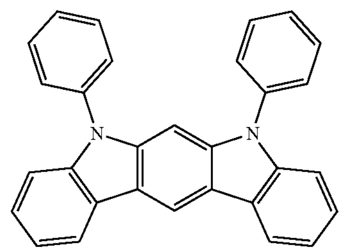
H-H89
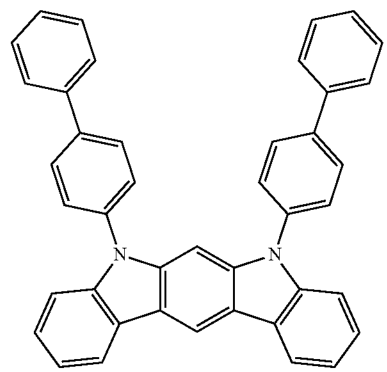

-continued
H-H90
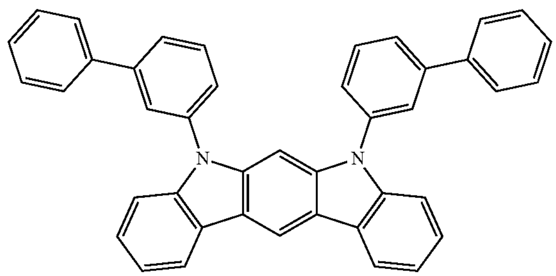
H-H91
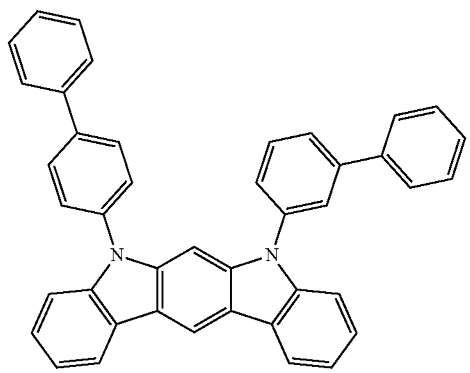
H-H92
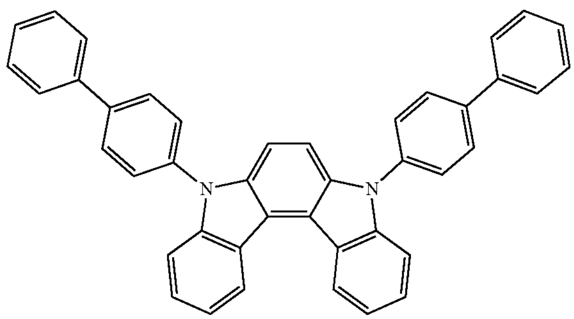
H-H93
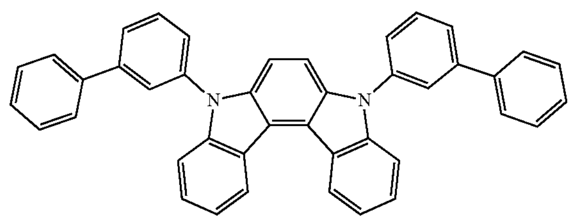
-continued
H-H94
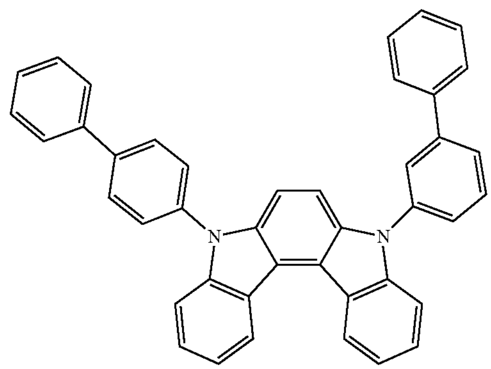
H-H95
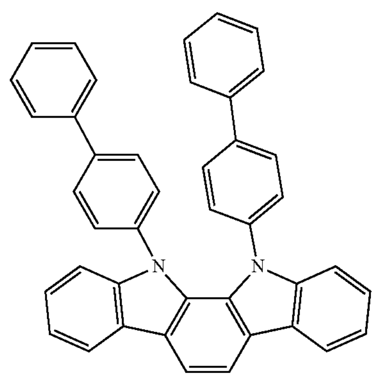
H-H96
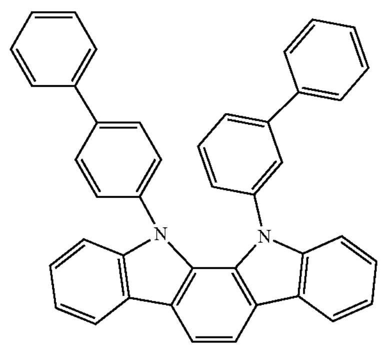
H-H97
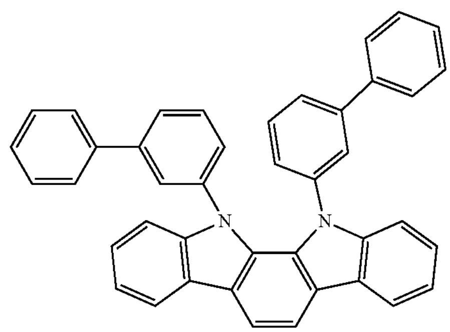

-continued
H-H98
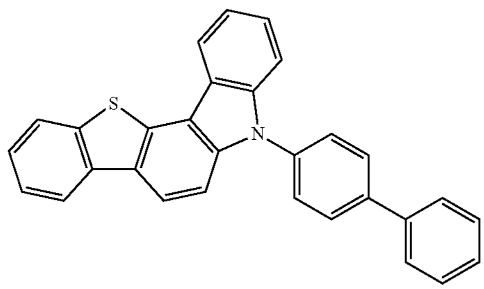
H-H99
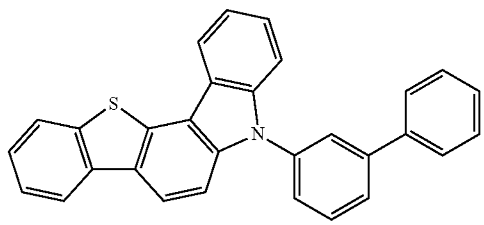
H-H100
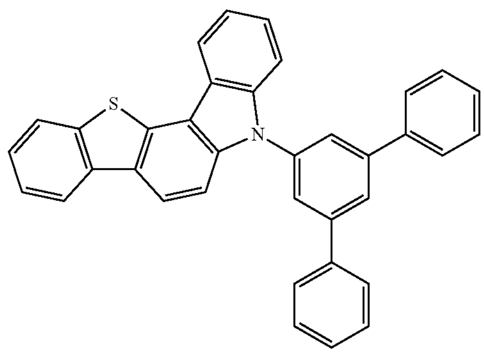
H-H101
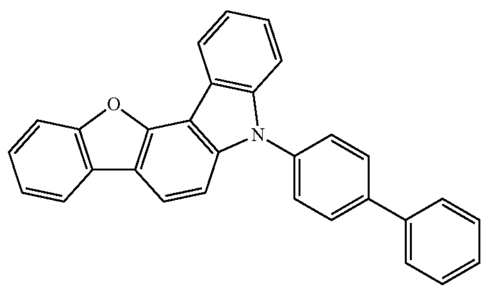
H-H102
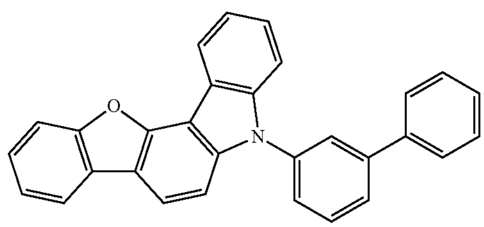
-continued
H-H103
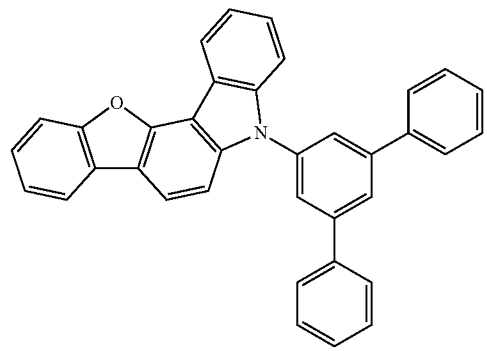
In one or more embodiments, the bipolar host may be compounds of Group HEH1, but embodiments of the present disclosure are not limited thereto:
Group HEH1
1
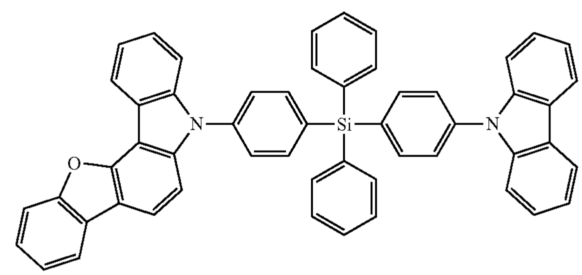
2
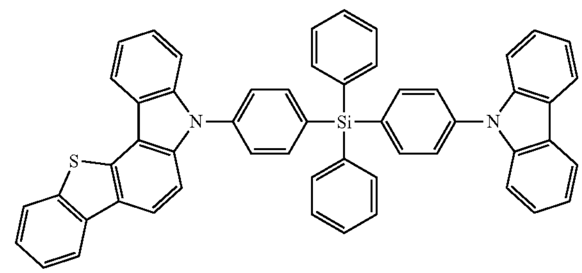
3
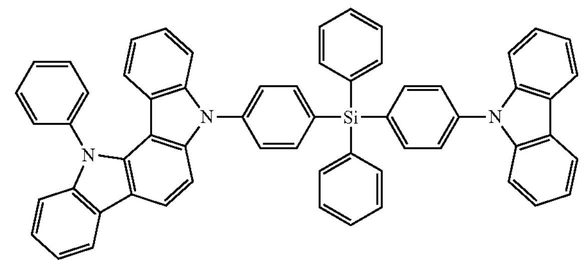

-continued
4
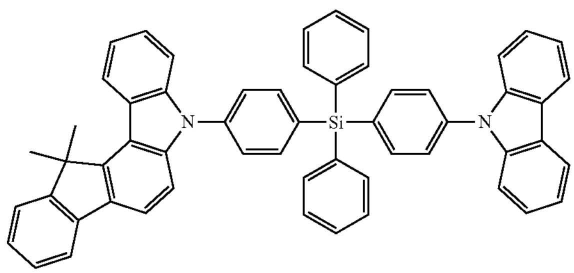
5
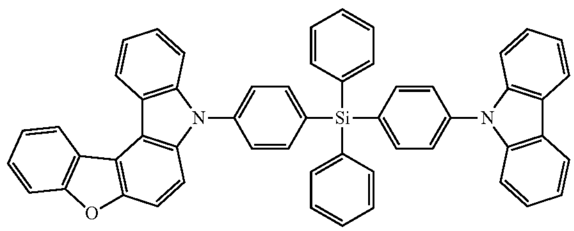
6
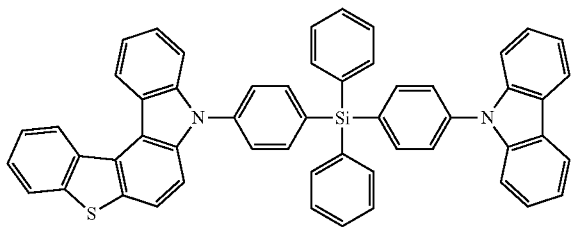
7
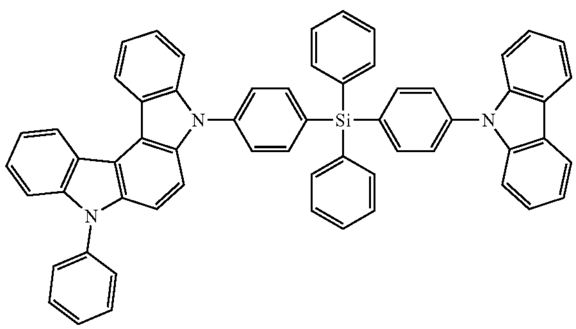
8
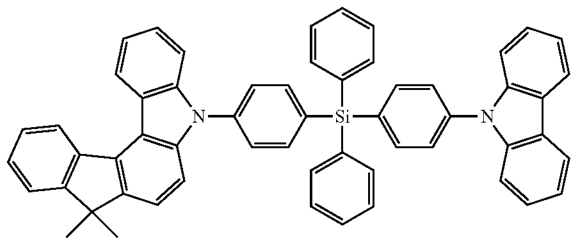
-continued
9
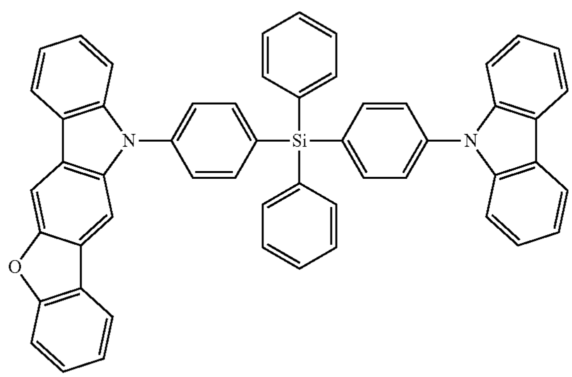
10
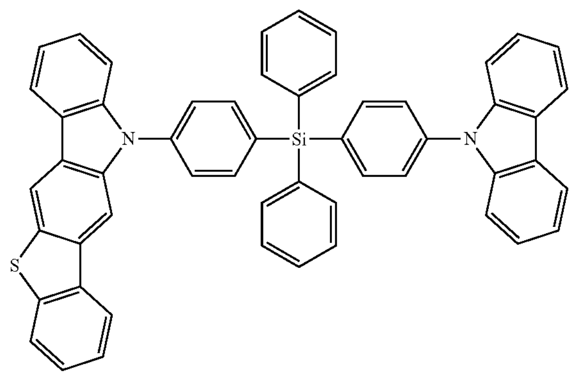
11
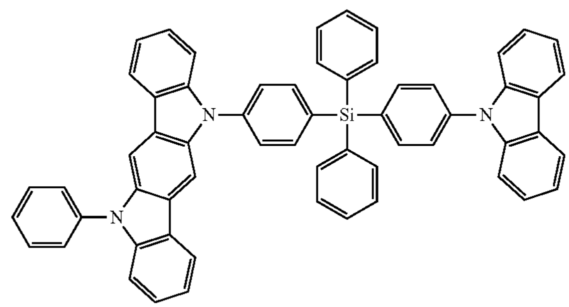
12
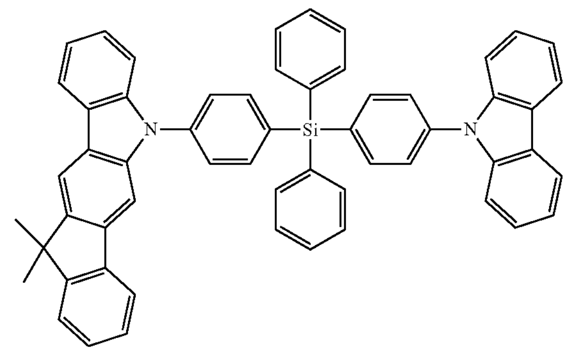

-continued
13
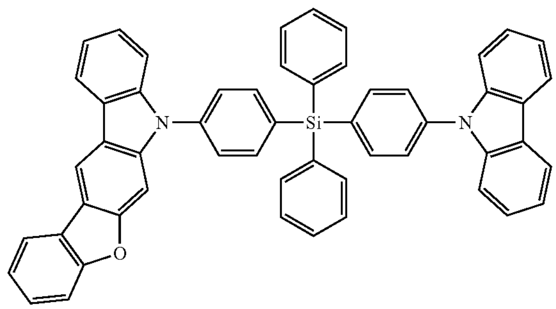
14
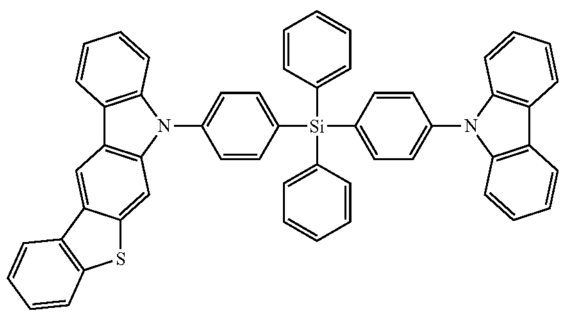
15
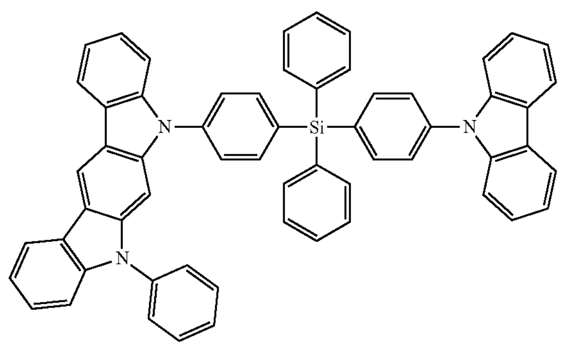
16
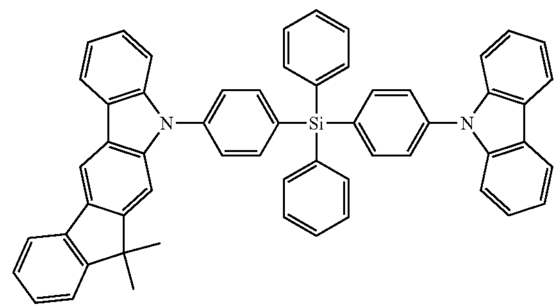
-continued
17
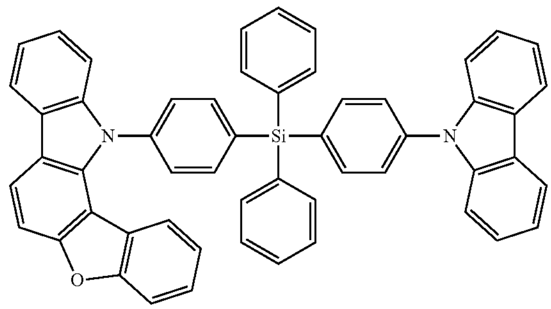
18
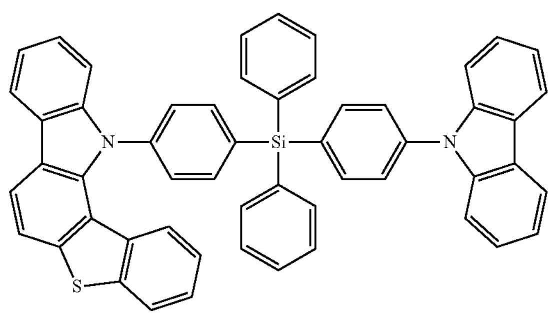
19
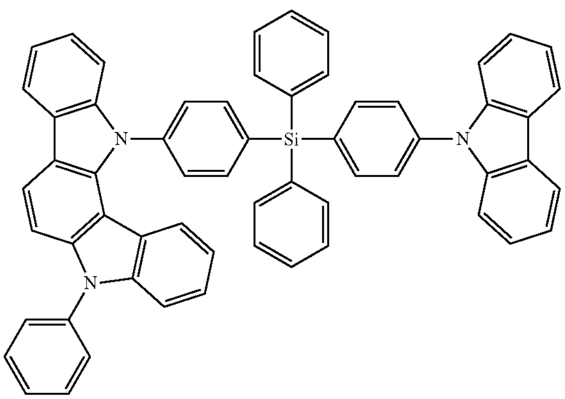
20
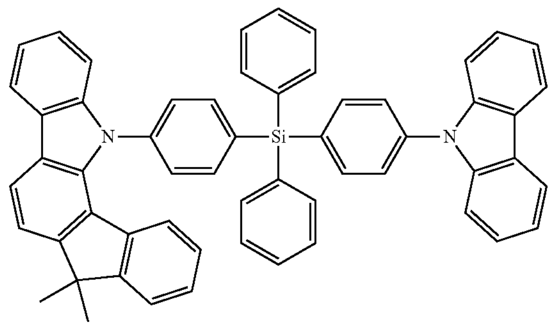

-continued
21
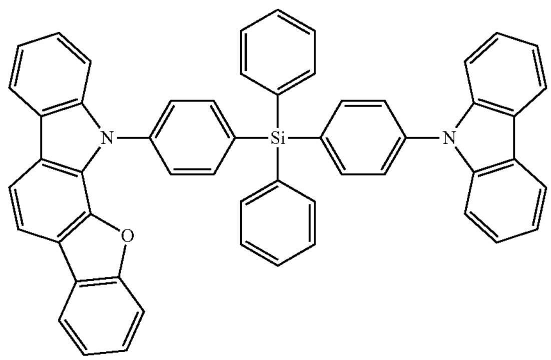
22
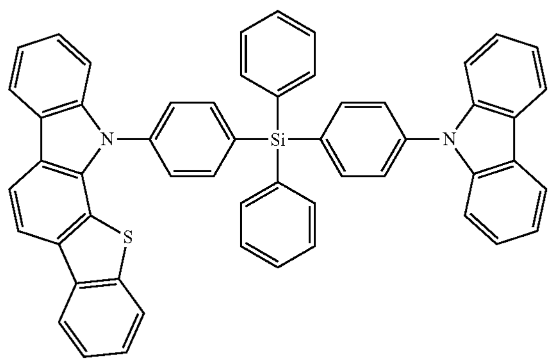
23
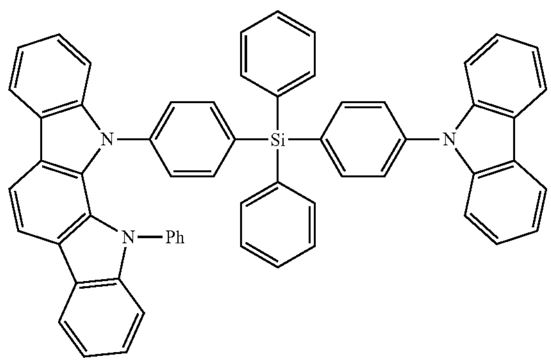
24
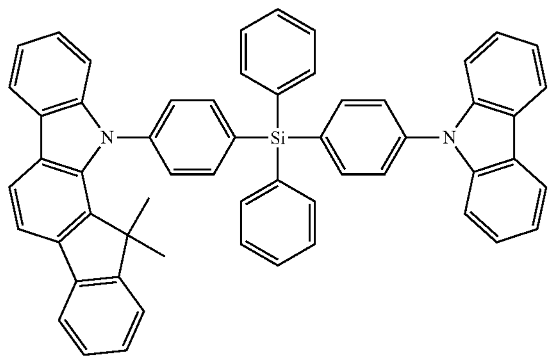
-continued
25
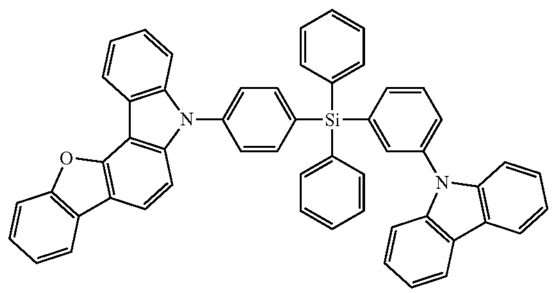
26
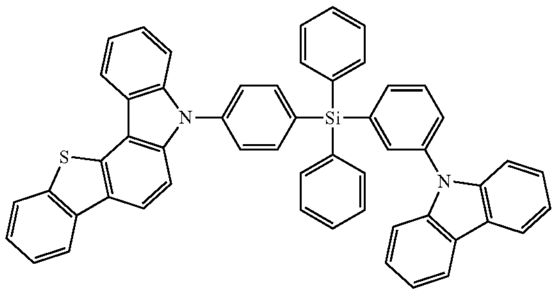
27
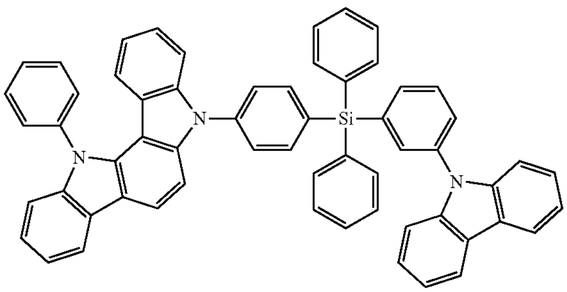
28
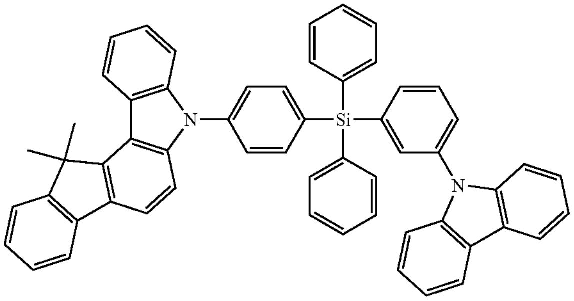
29
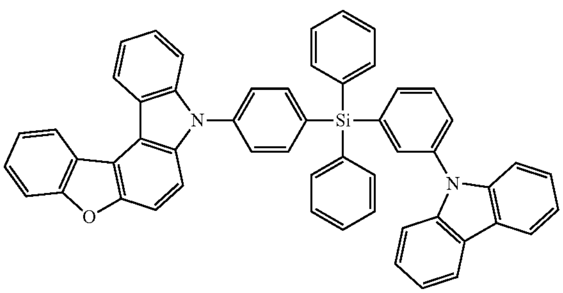

-continued
30
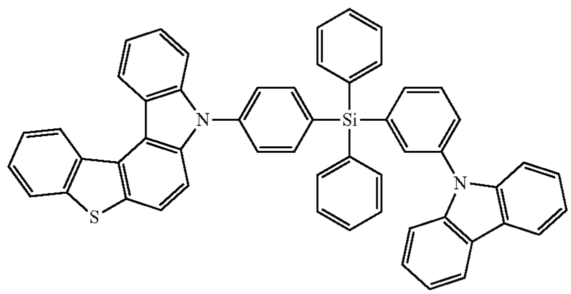
31
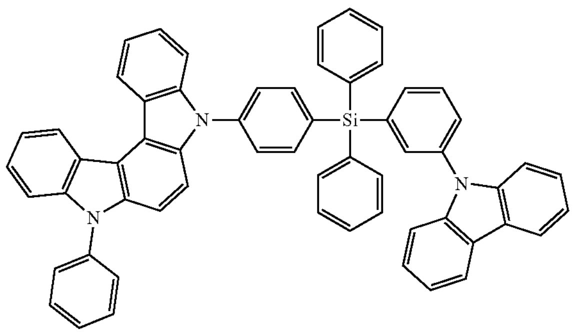
32
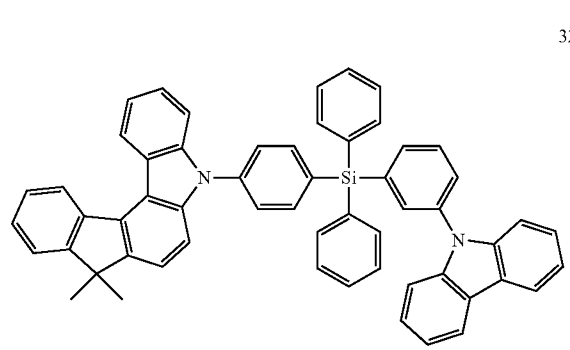
33
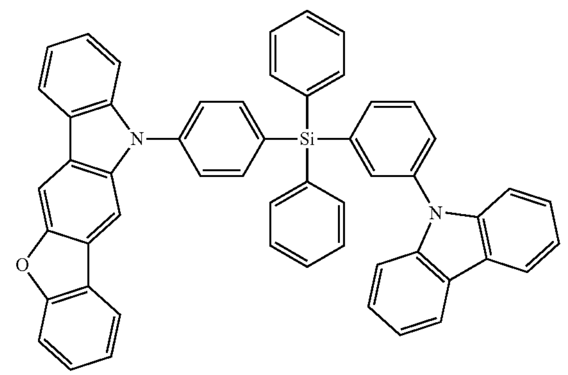
-continued
34
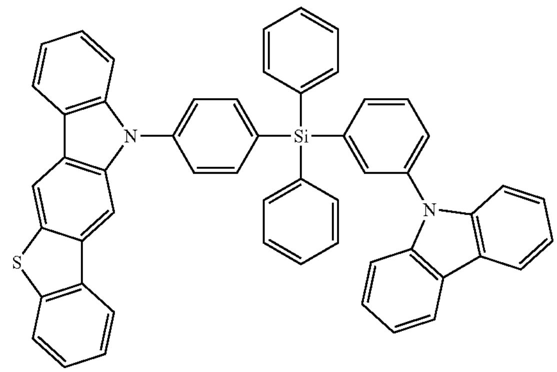
35
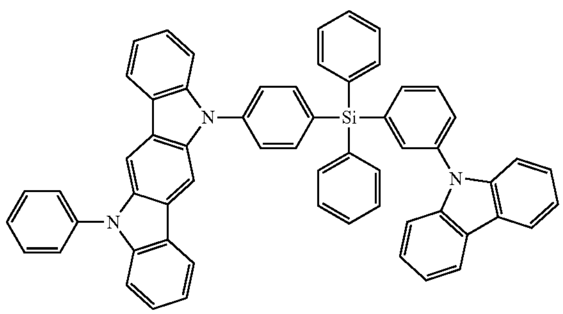
36
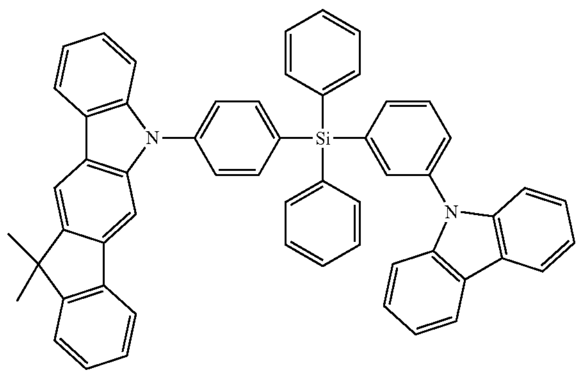
37
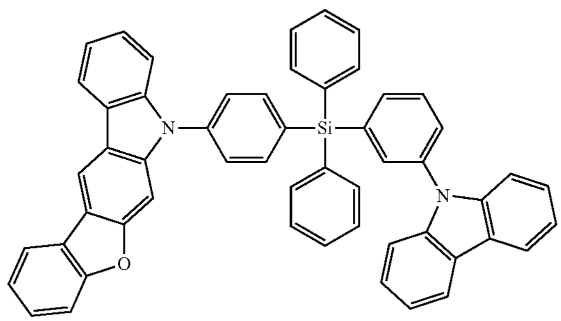

-continued
38
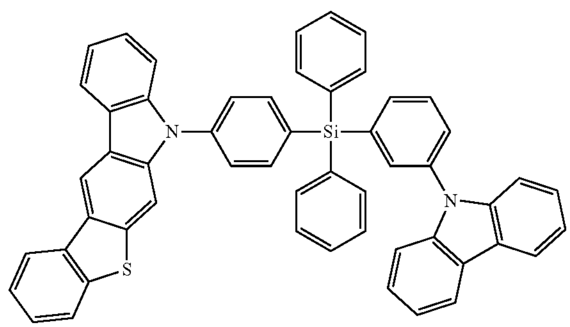
39
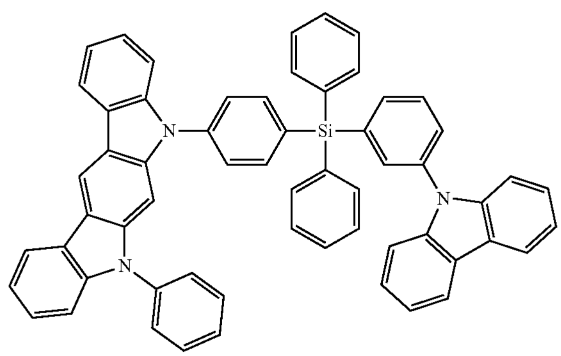
40
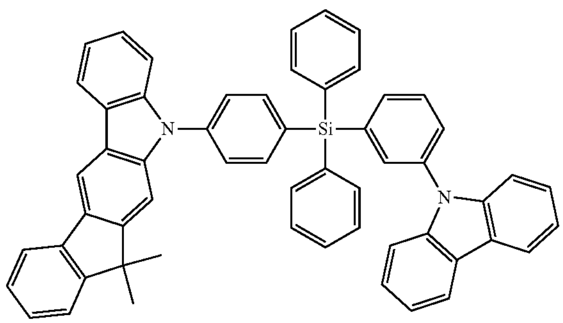
41
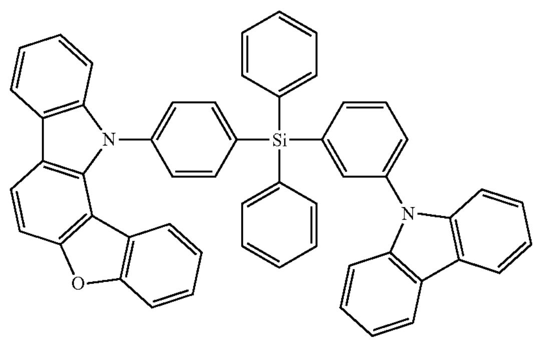
-continued
42
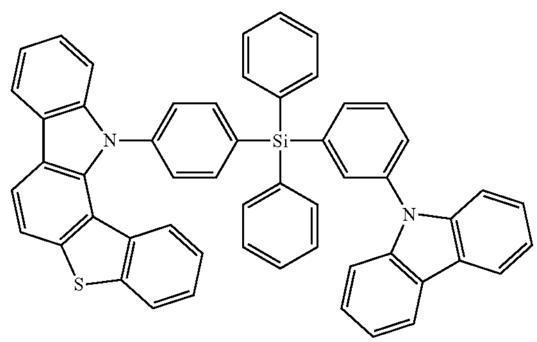
43
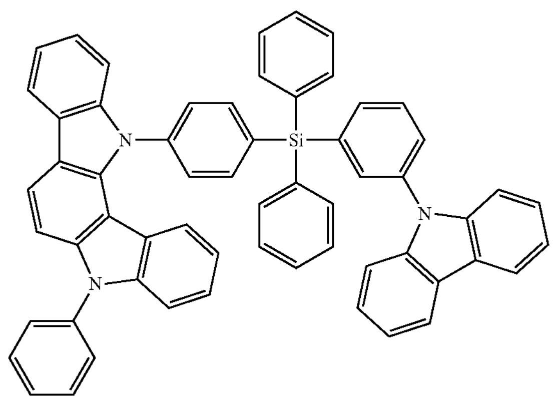
44
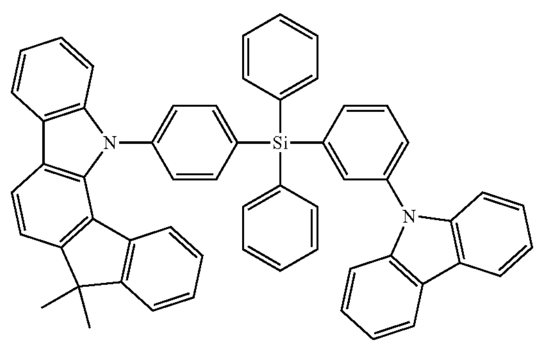
45
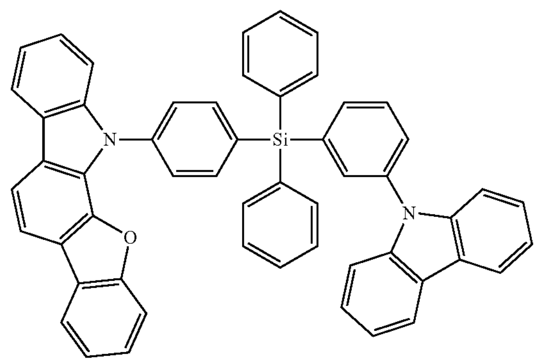

-continued
46
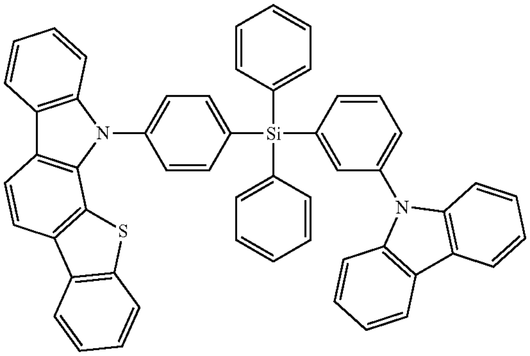
47
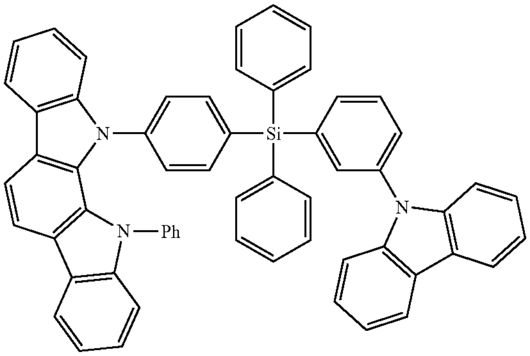
48
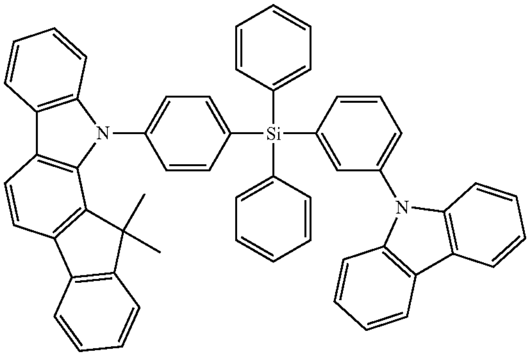
49
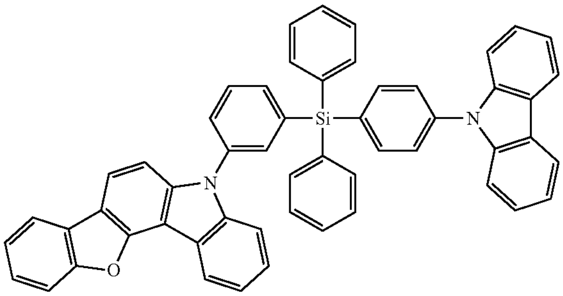
-continued
50
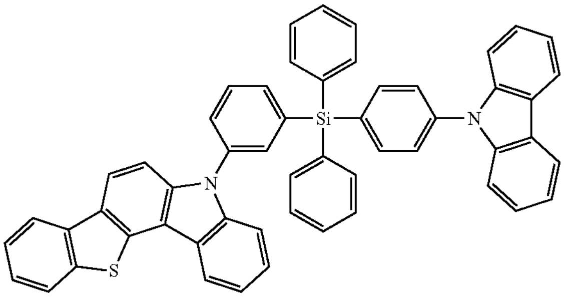
51
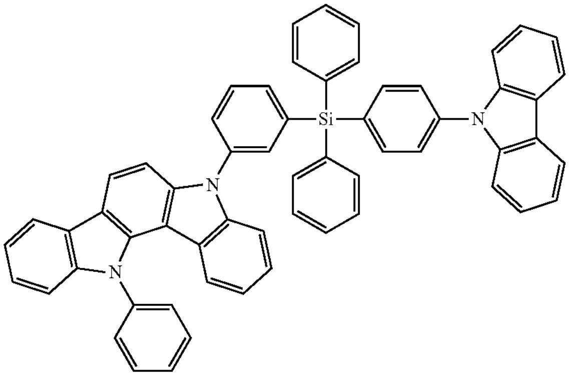
52
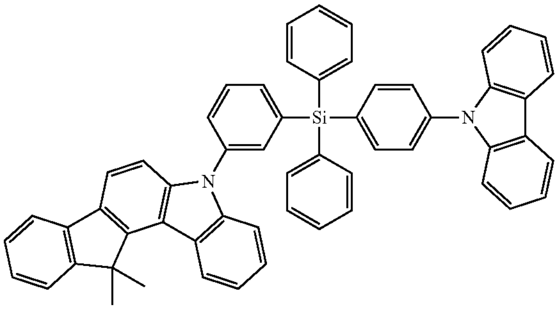
53
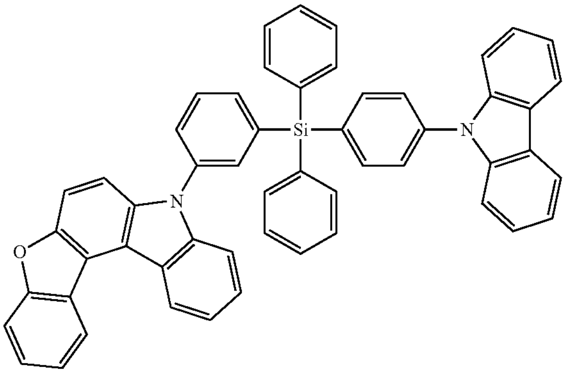

-continued
54
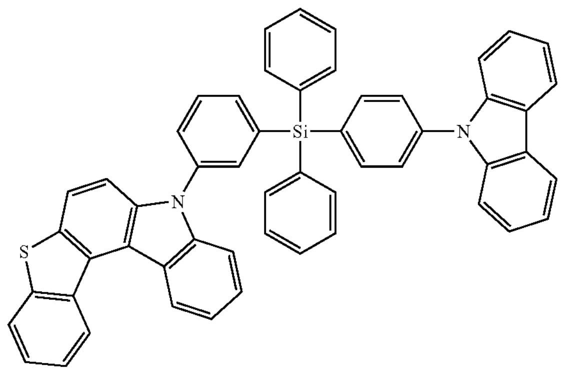
55
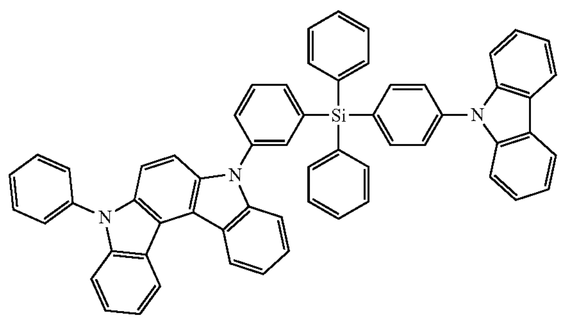
56
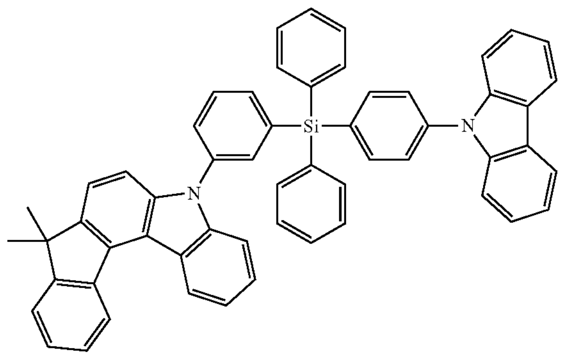
57
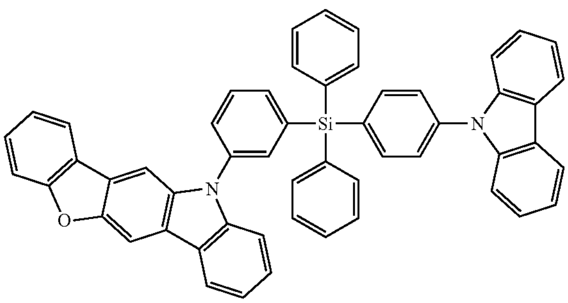
-continued
58
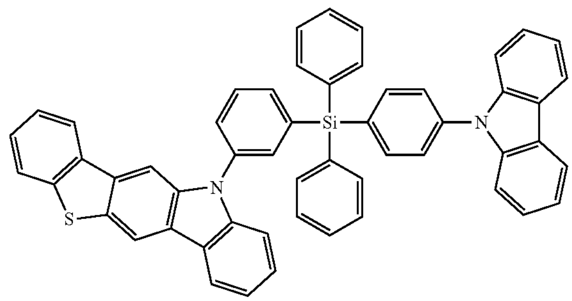
59
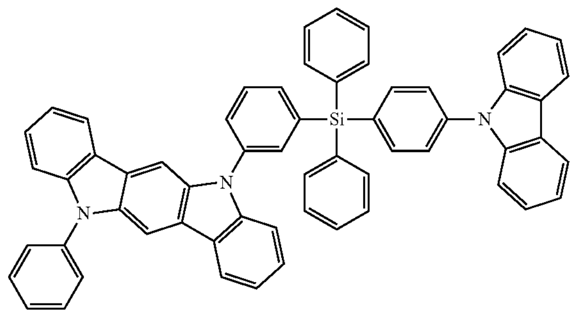
60
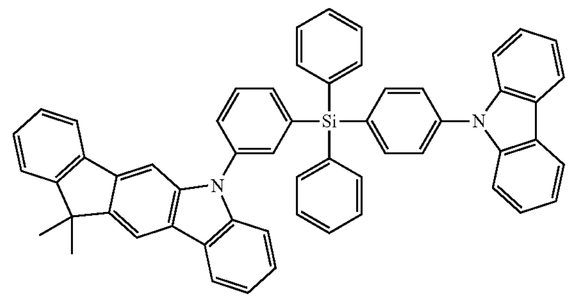
61
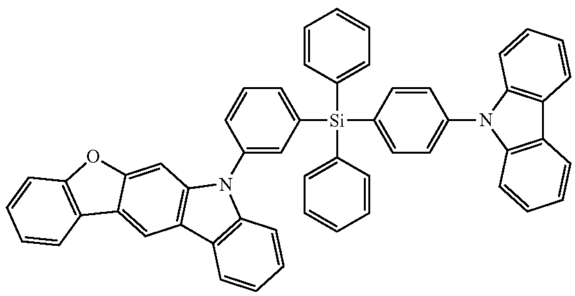
62
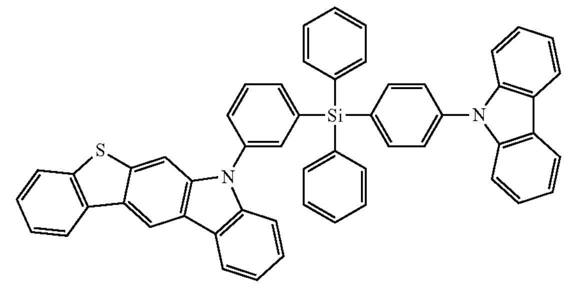

63
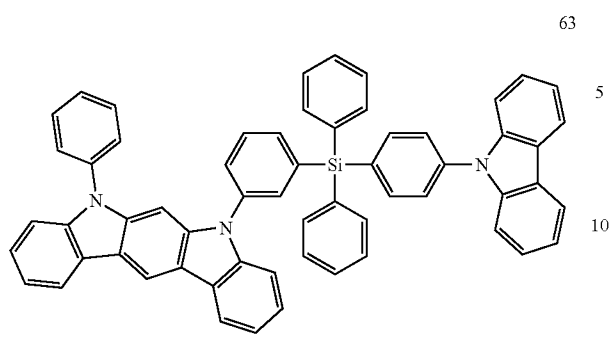
64
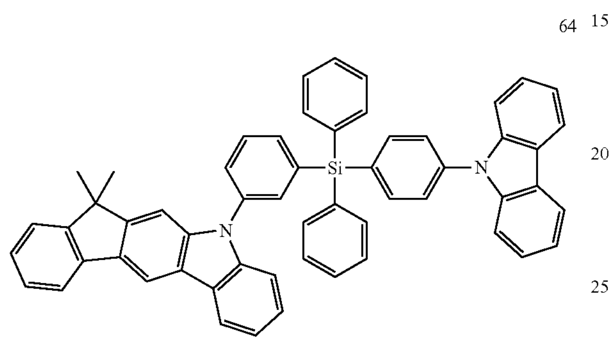
65
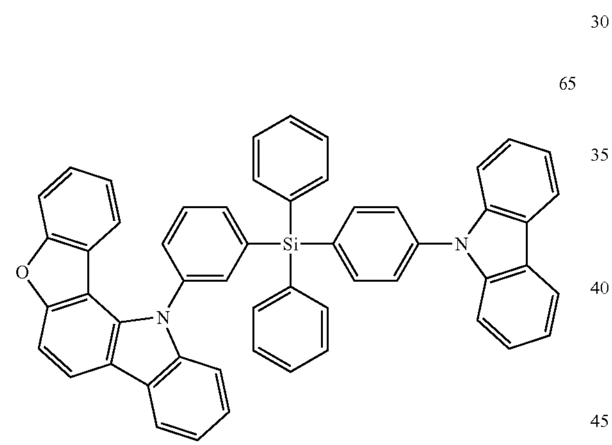
66
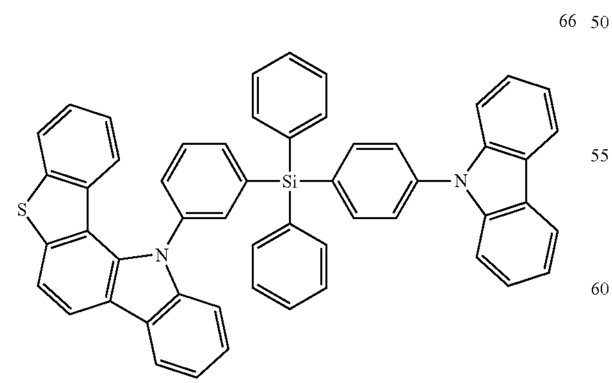
67
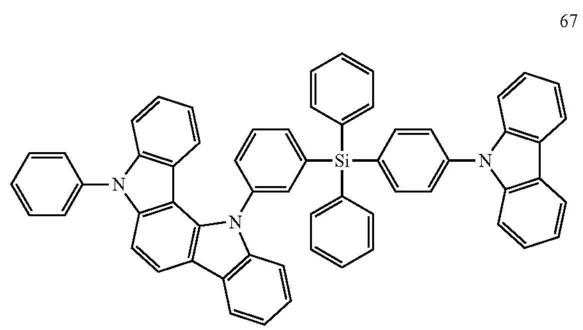
68
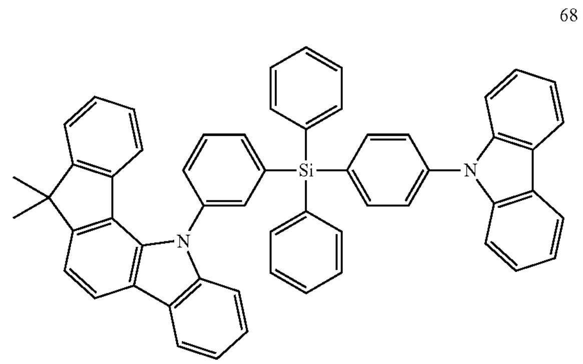
69
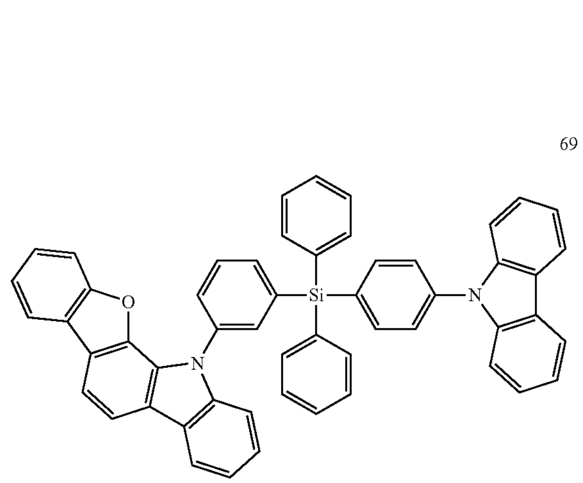
70
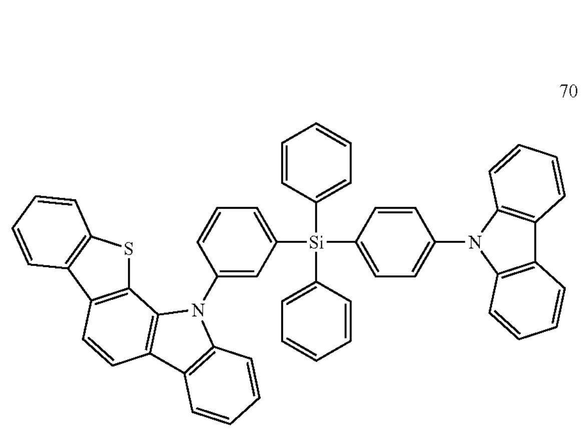

-continued
71
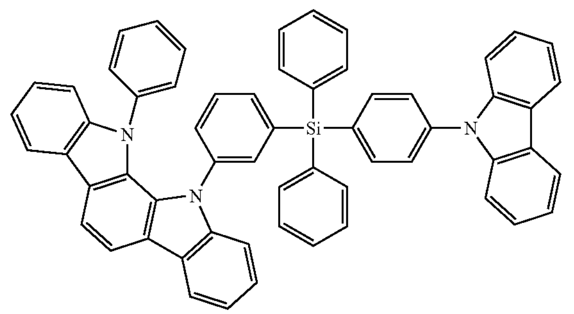
72
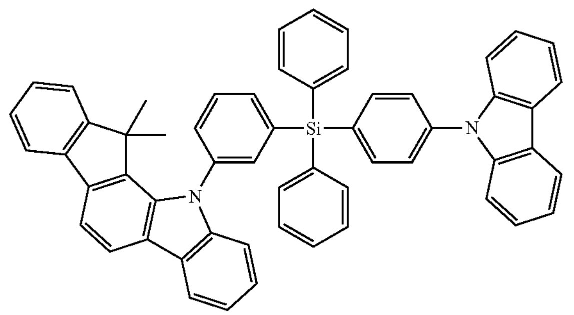
73
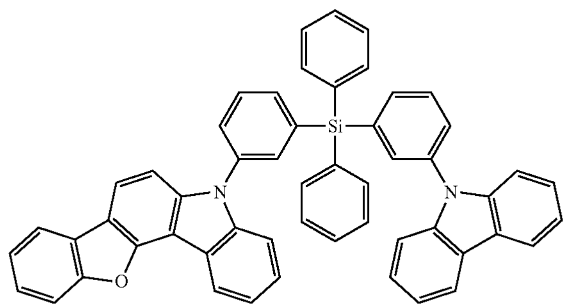
74
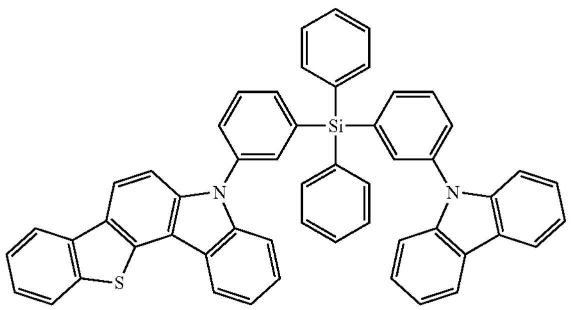
-continued
75
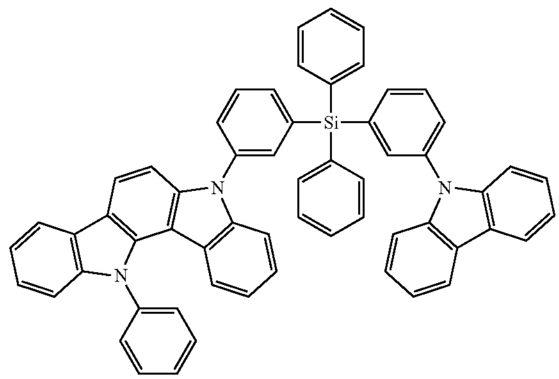
76
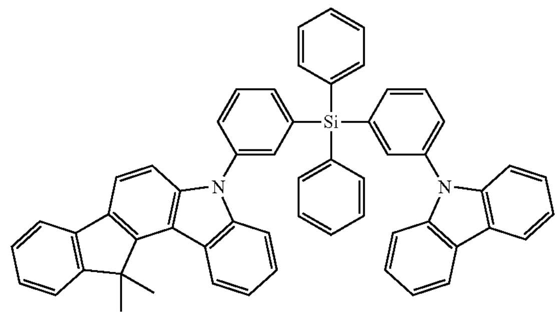
77
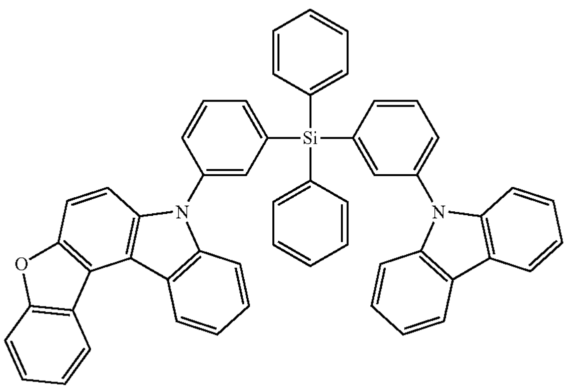
78
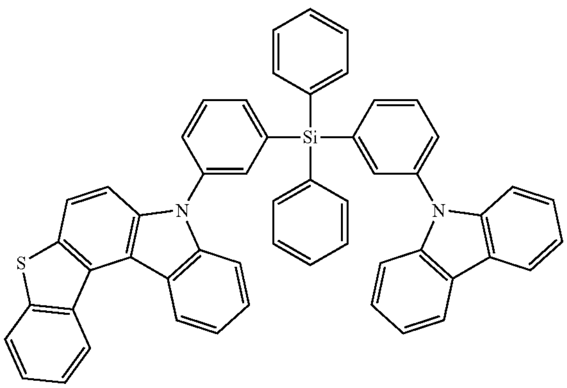

-continued
79
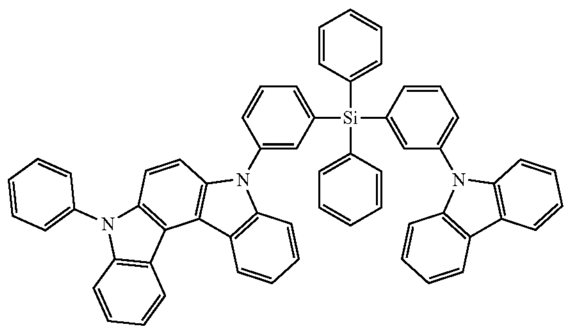
80
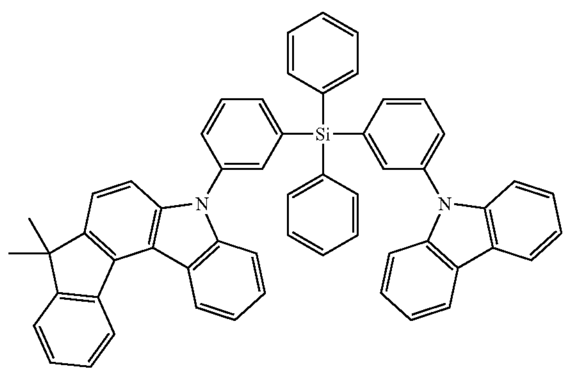
81
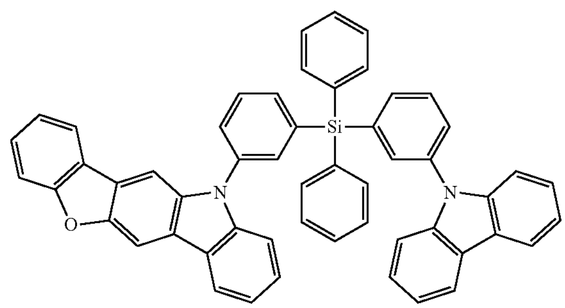
82
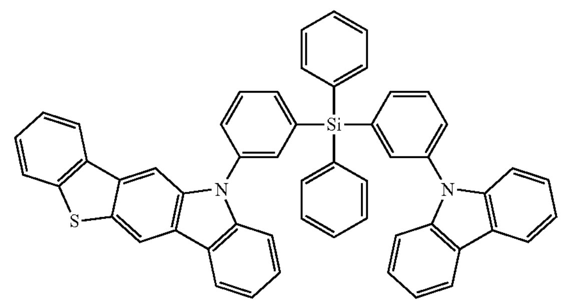
-continued
83
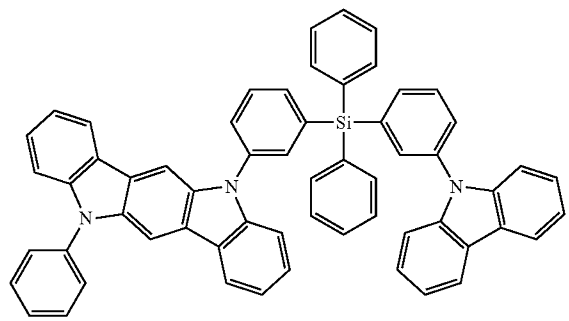
84
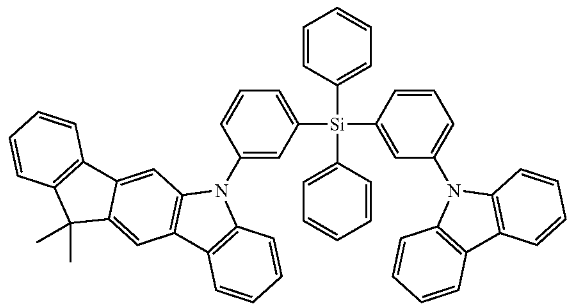
85
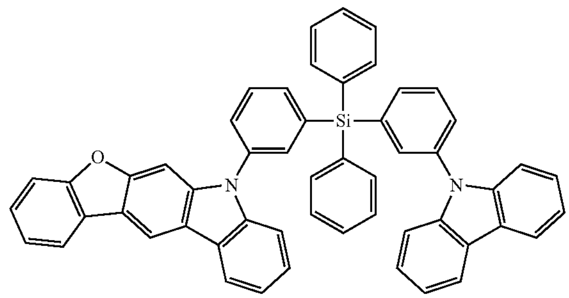
86
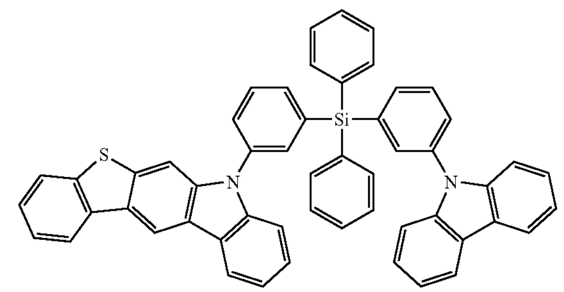
87
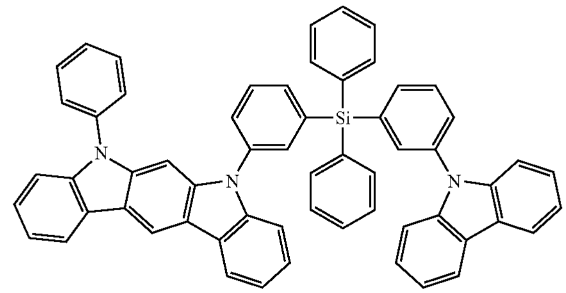

88
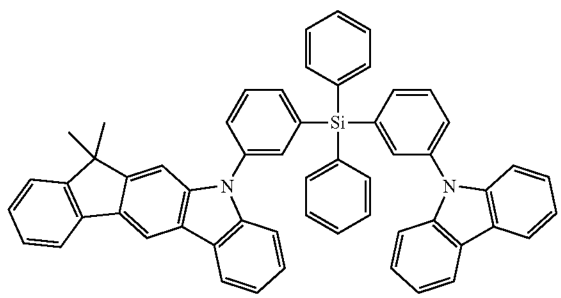
89
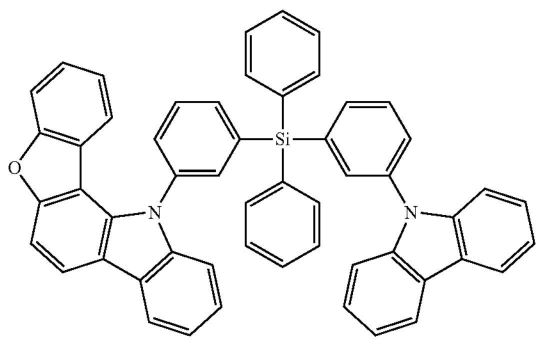
90
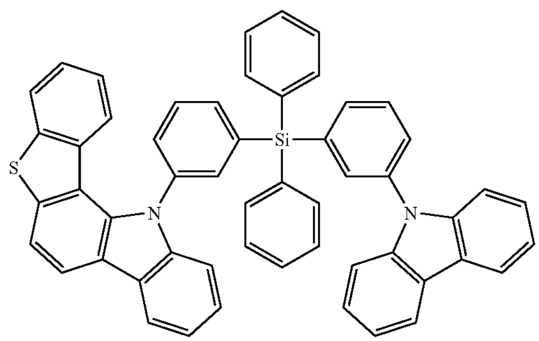
91
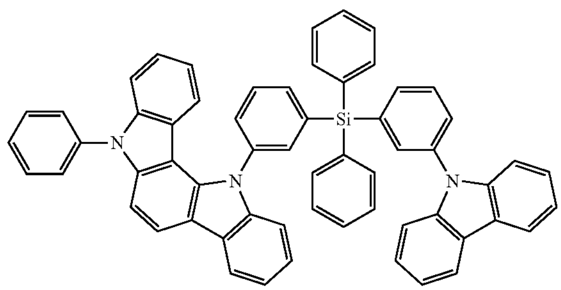
92
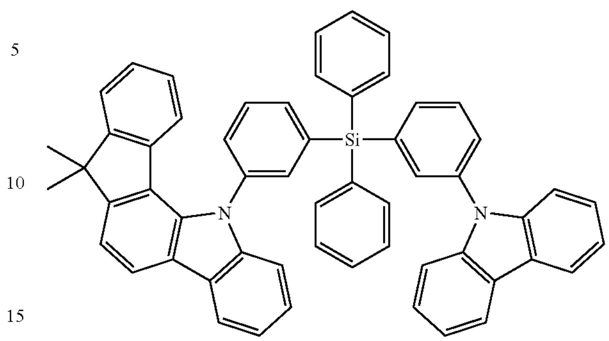
93
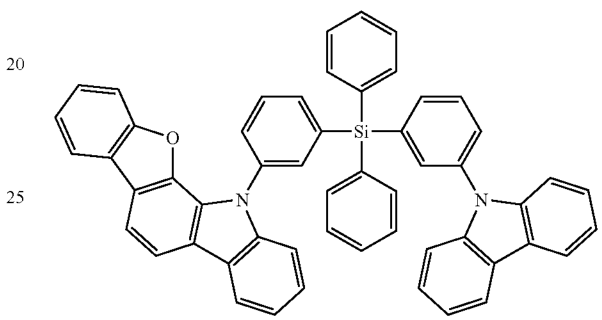
94
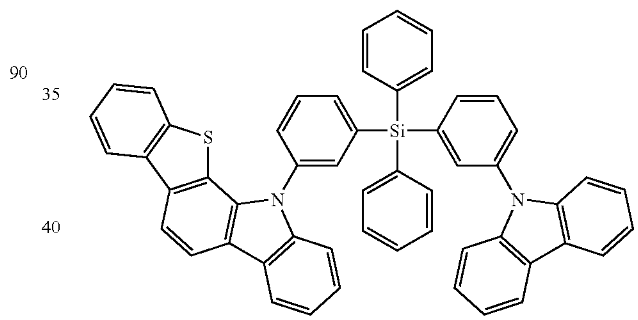
95
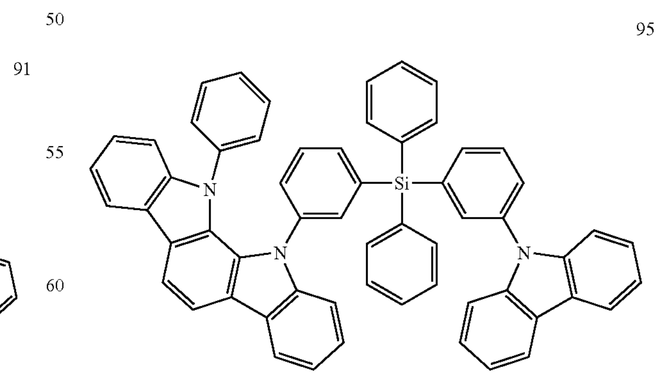

-continued
96
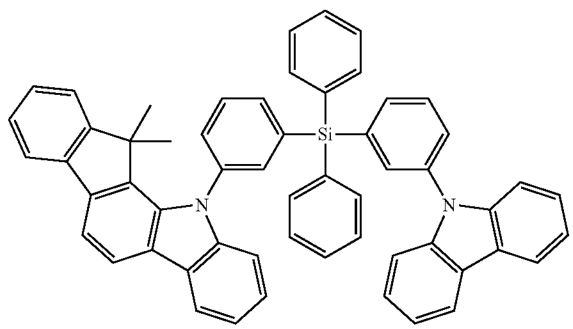
97
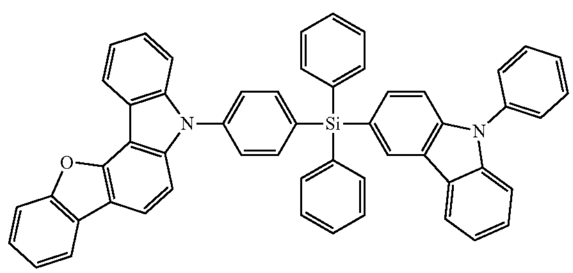
98
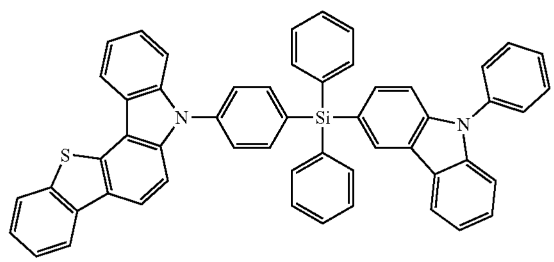
99
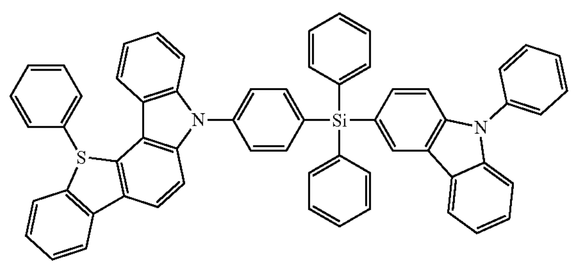
100
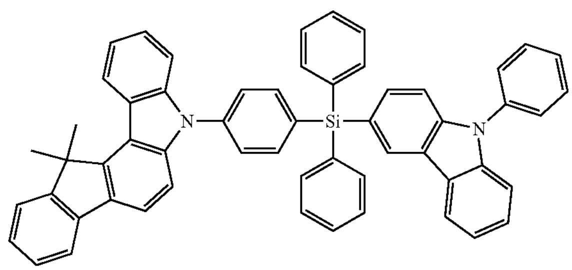
-continued
101
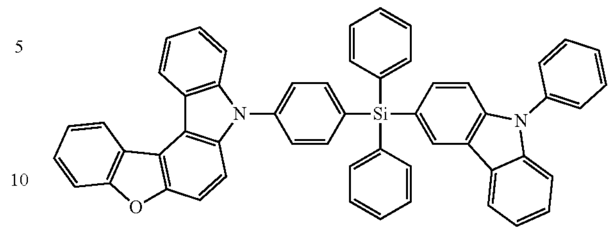
102
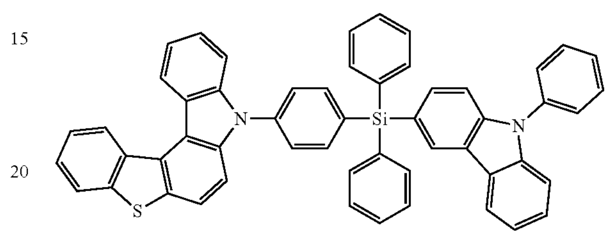
103
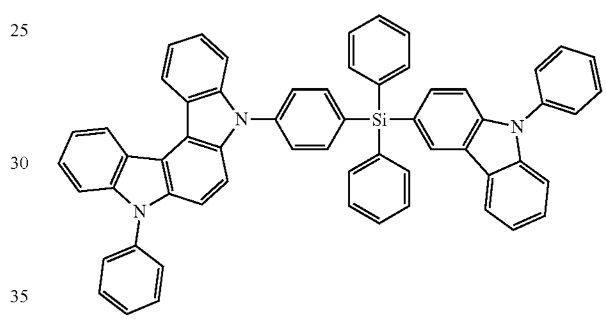
104
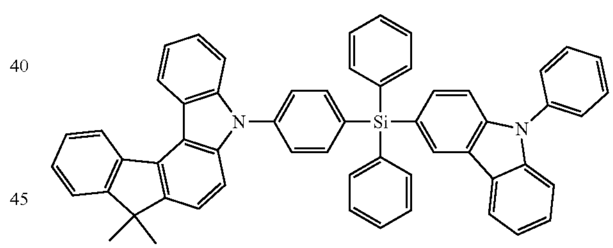
105
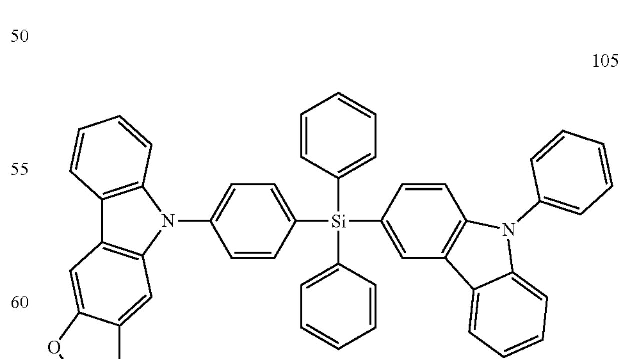

-continued
106
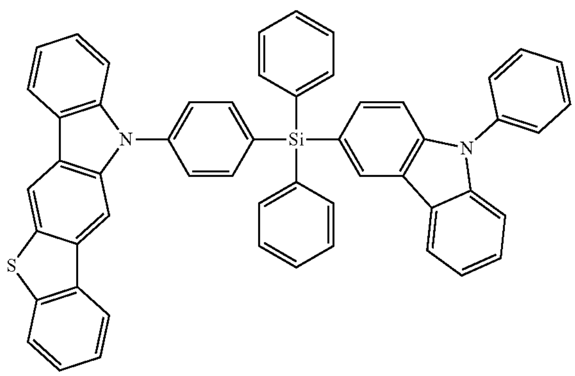
107
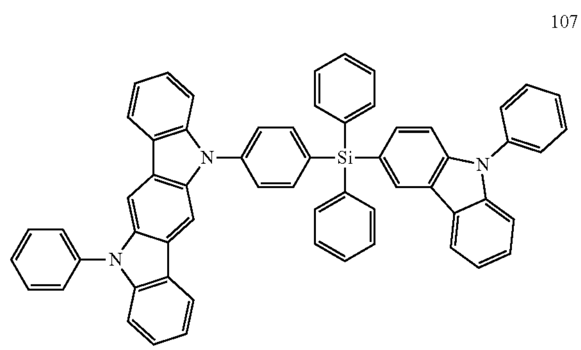
108
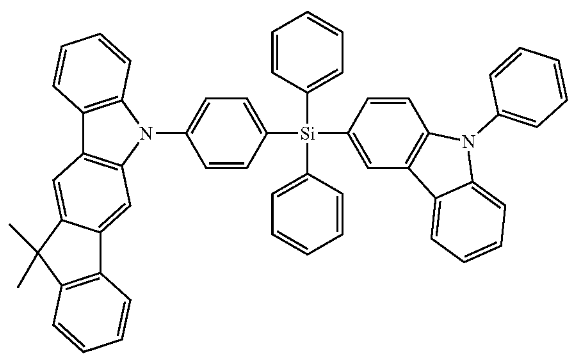
109
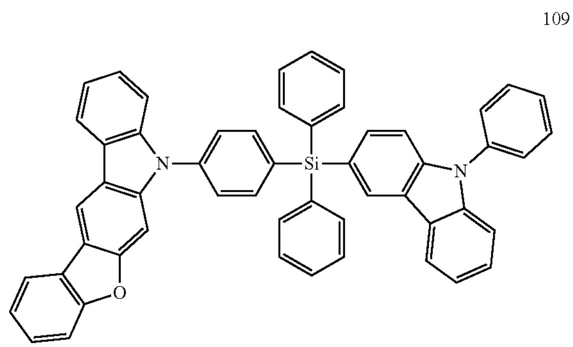
-continued
110
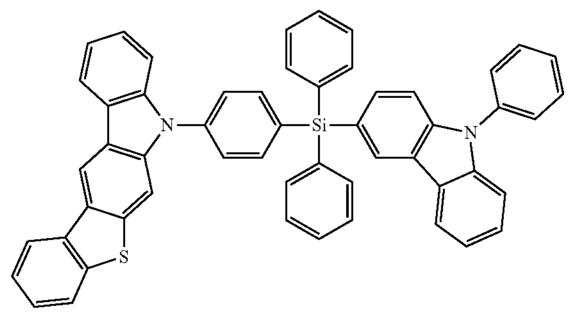
111
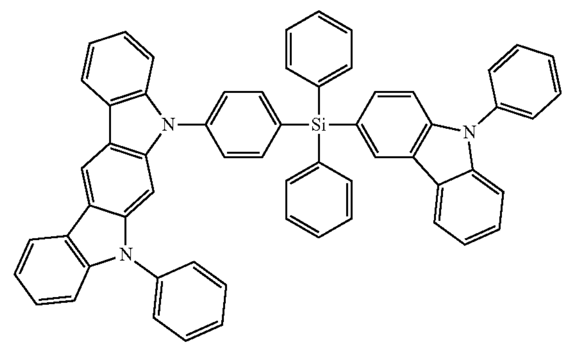
112
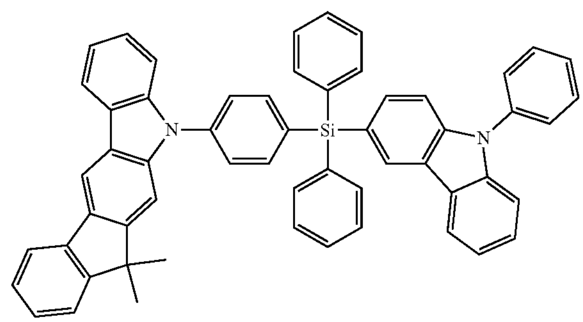
113
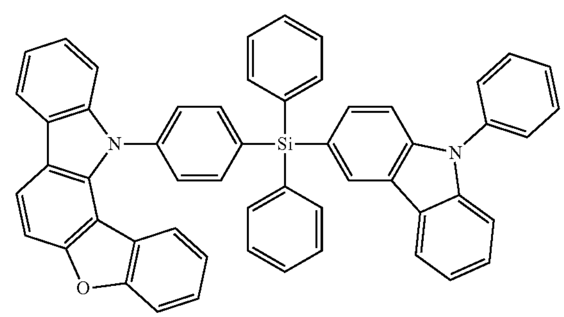

-continued
114
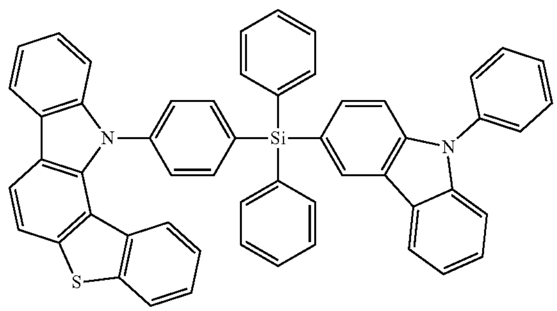
115
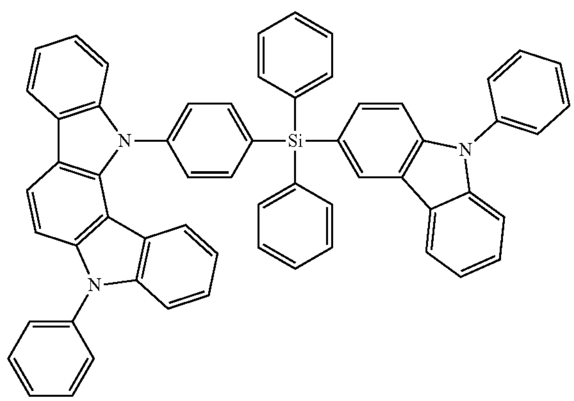
116
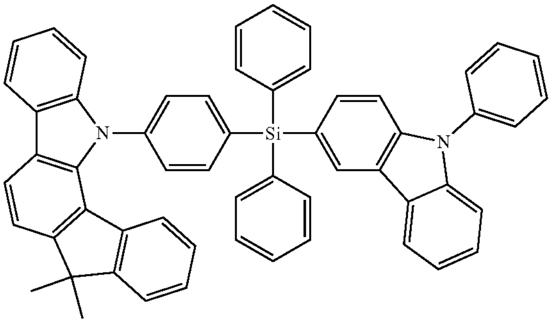
117
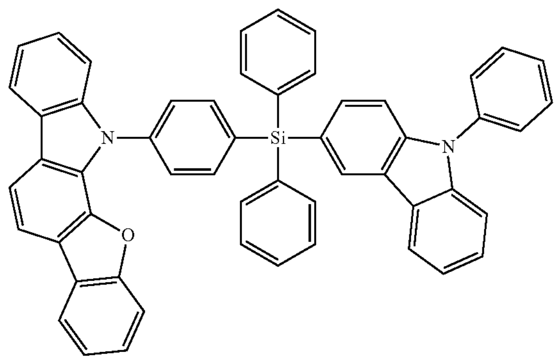
-continued
118
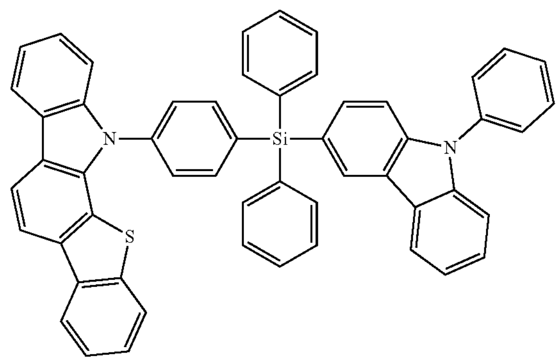
119
120
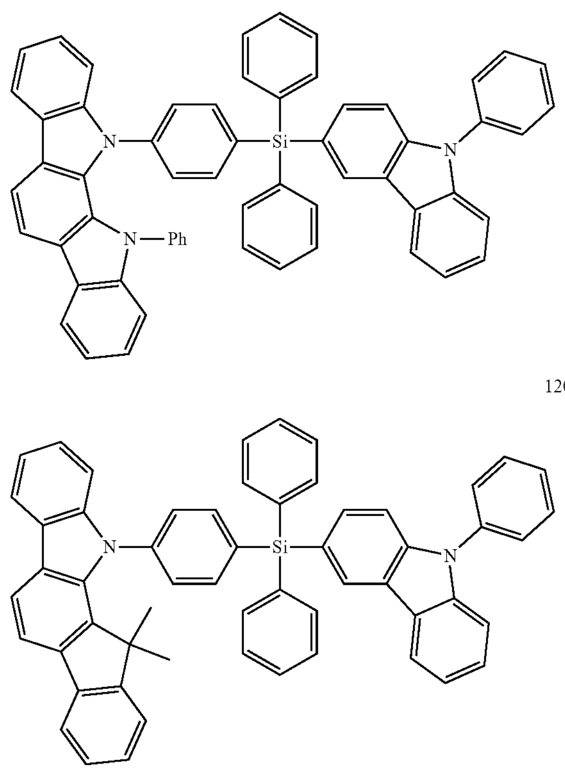
121
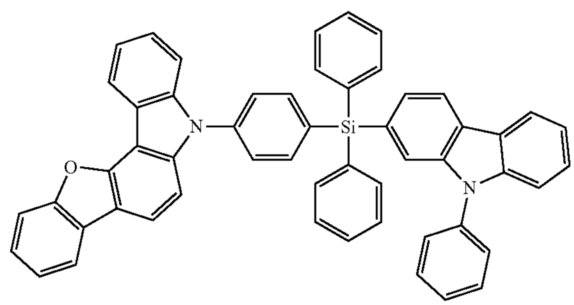

-continued
122
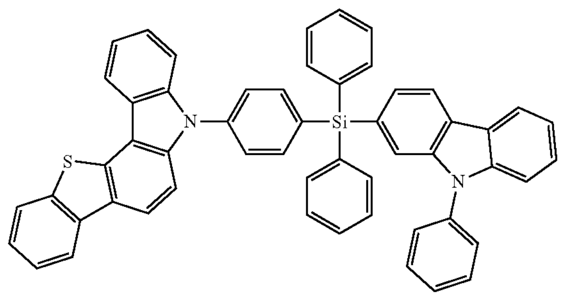
123
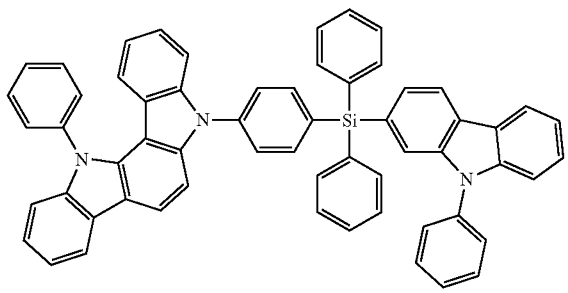
124
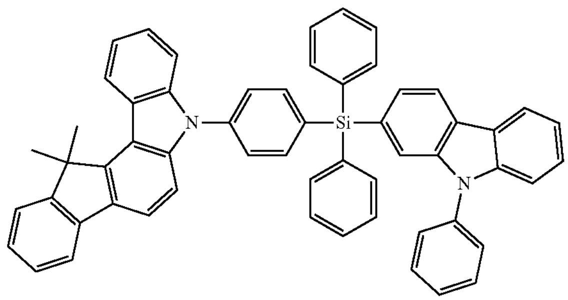
125
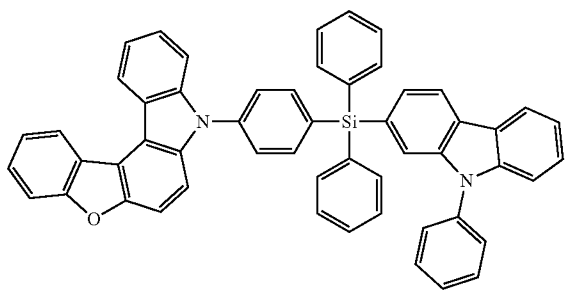
126
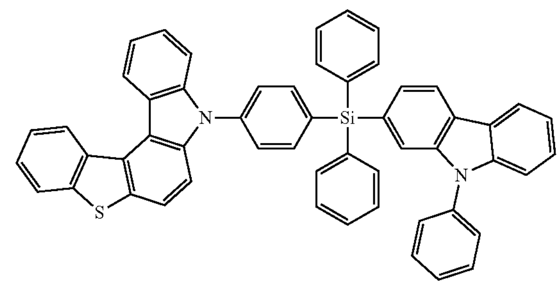
-continued
127
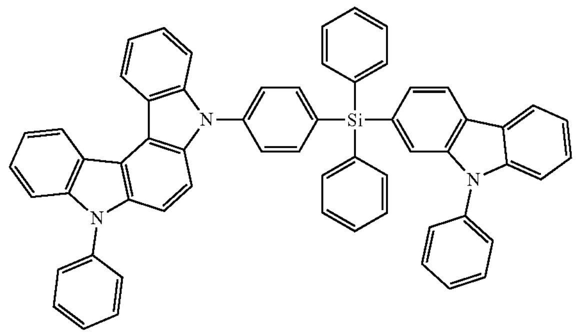
128
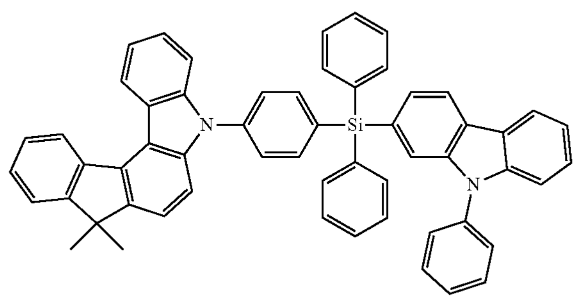
129
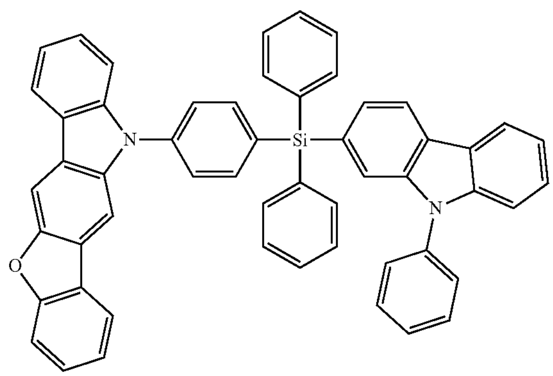
130
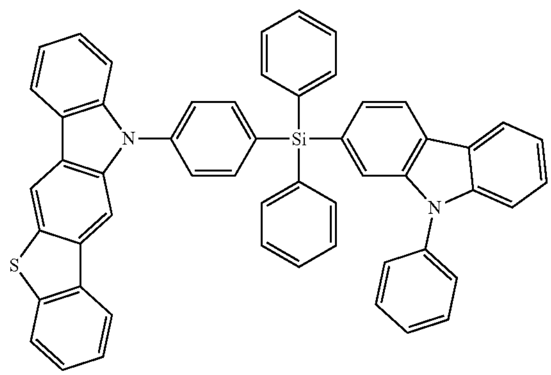

131
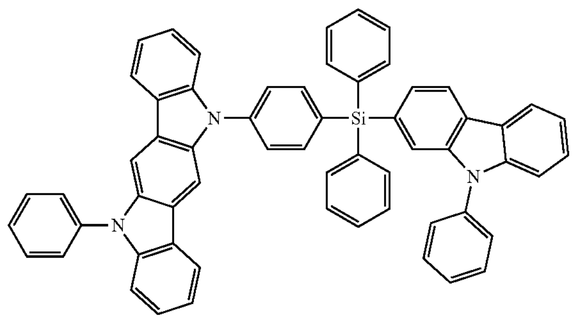
132
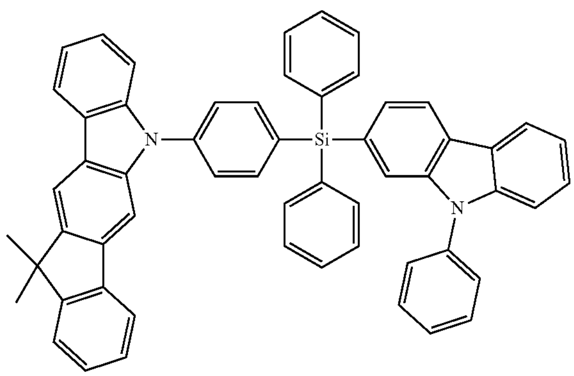
133
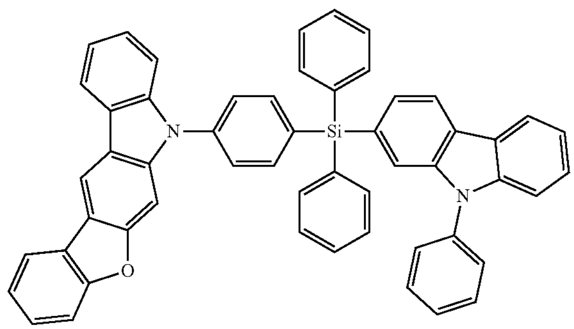
134
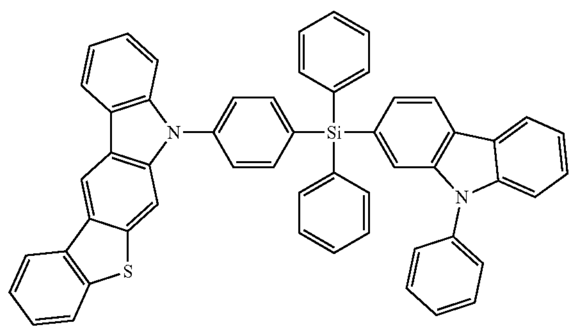
135
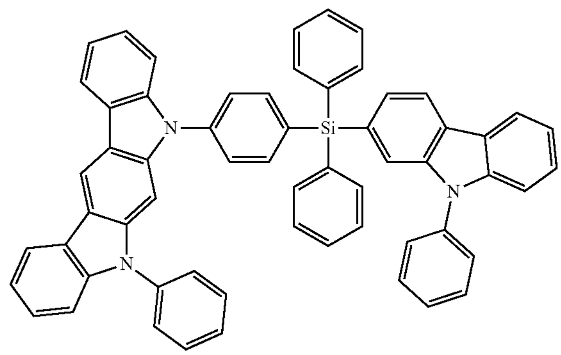
136
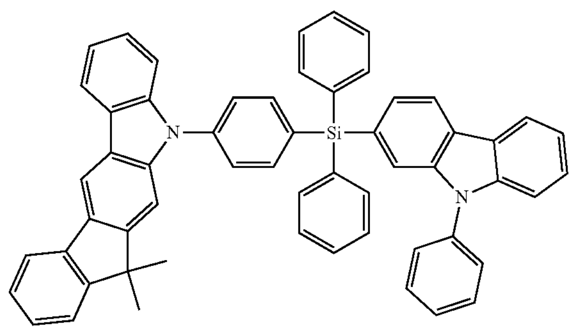
137
138
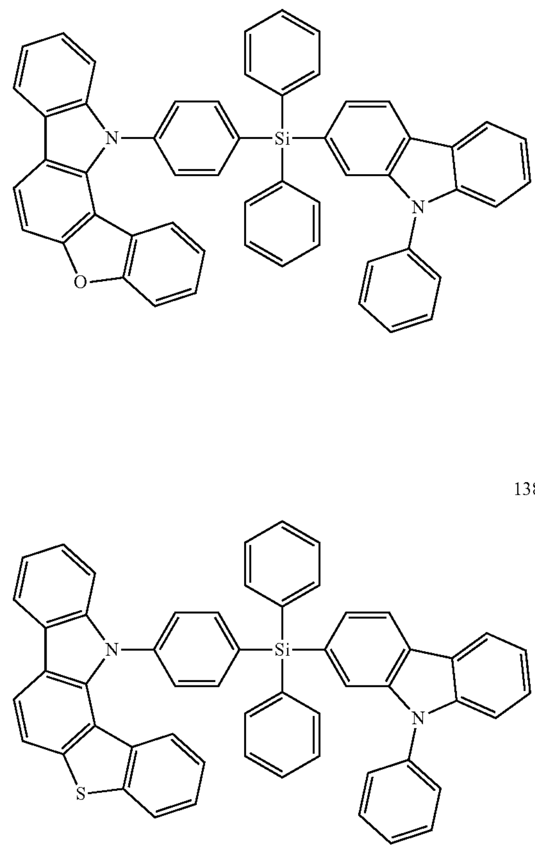

139
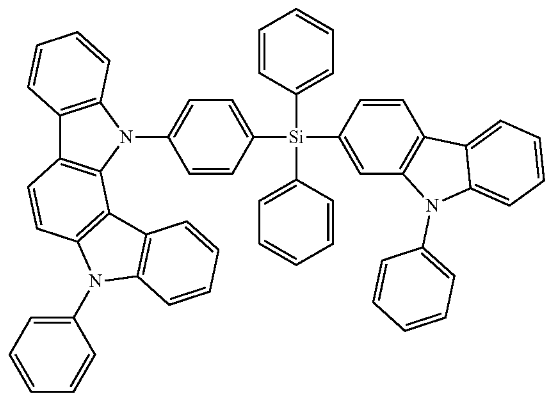
140
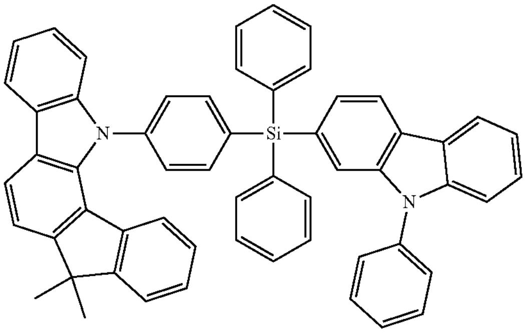
141
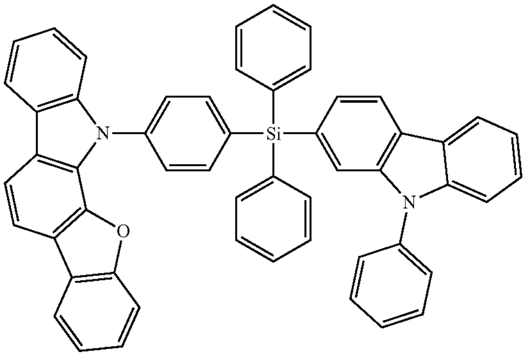
142
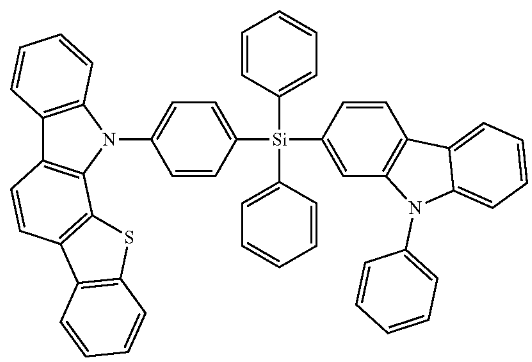
143
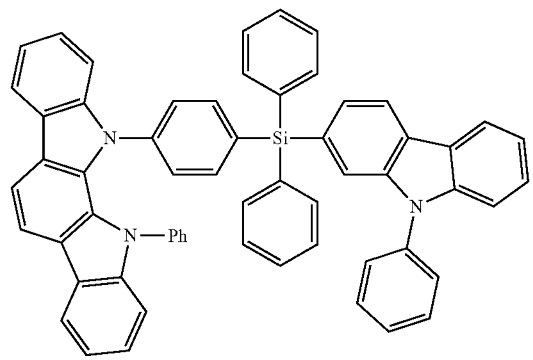
144
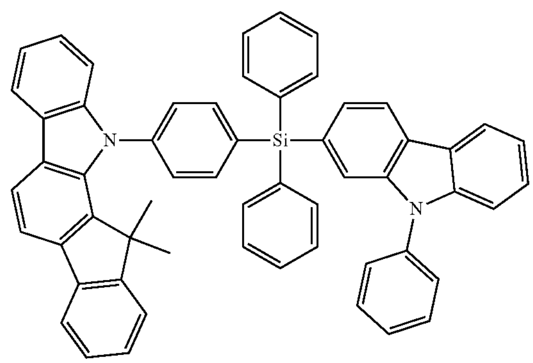
145
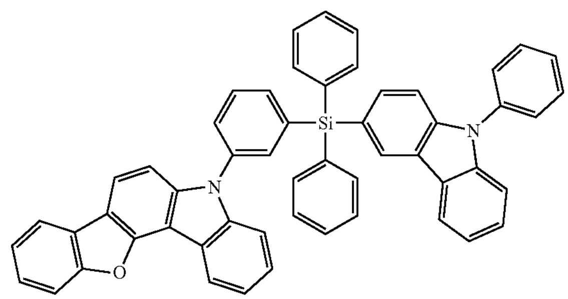
146
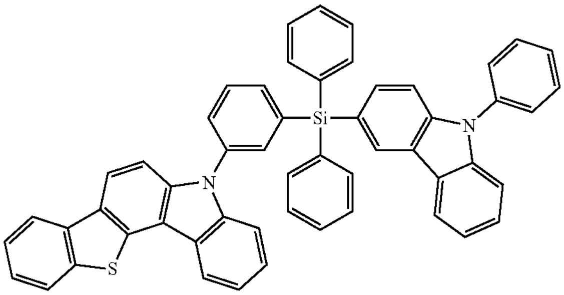

-continued
147
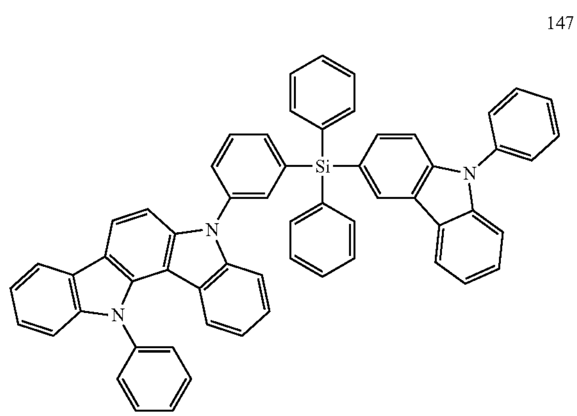
148
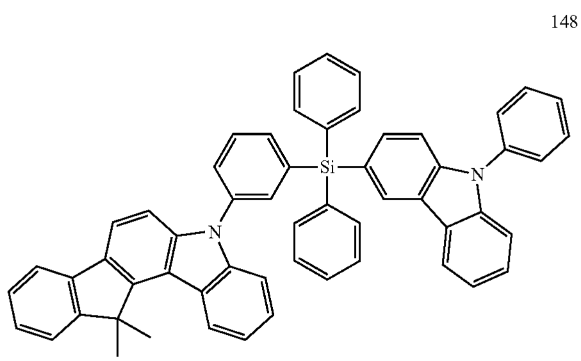
149
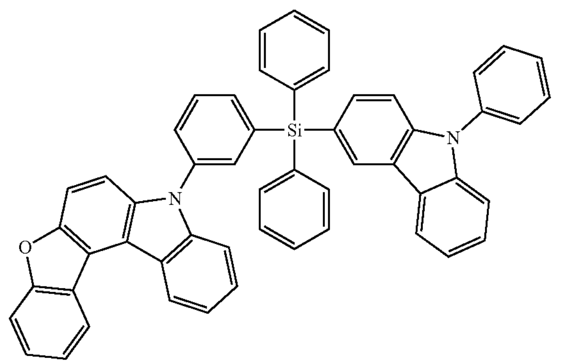
150
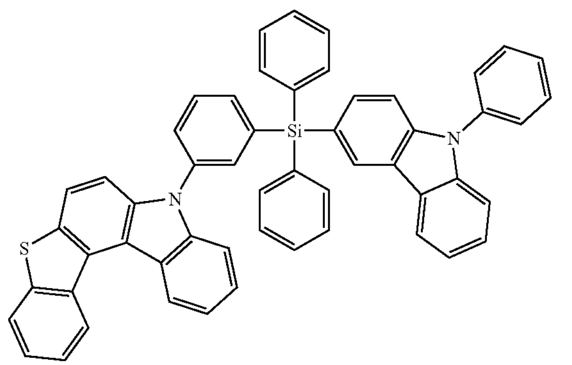
-continued
151
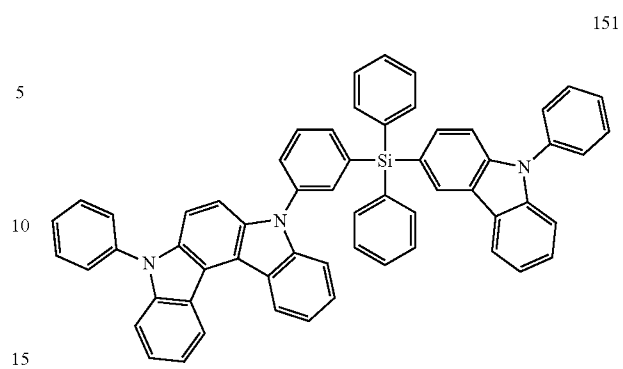
152
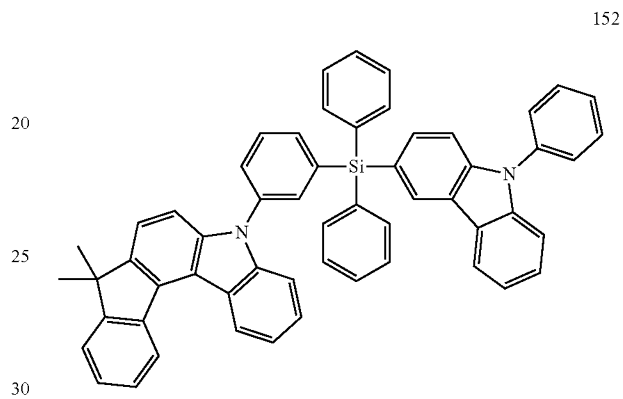
153
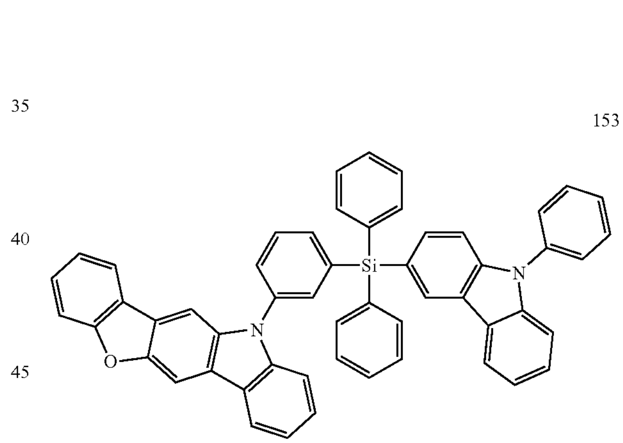
154
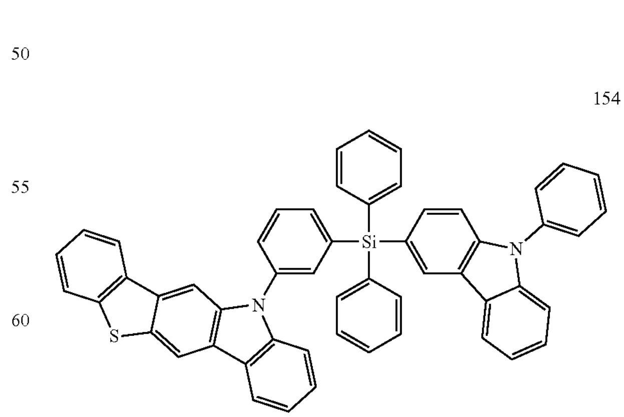

-continued
155
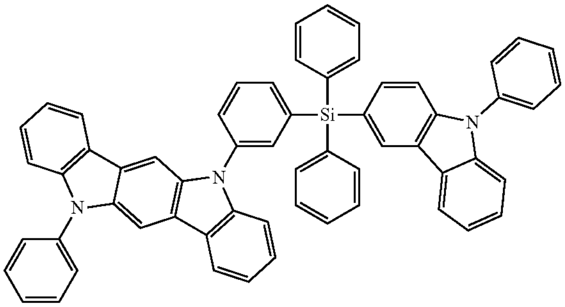
156
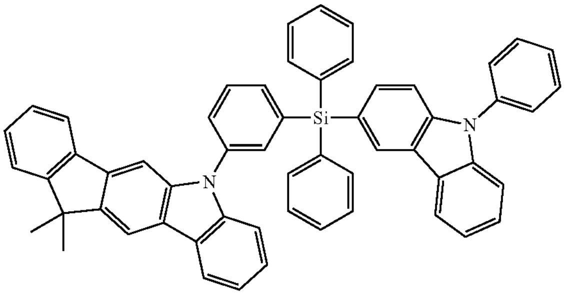
157
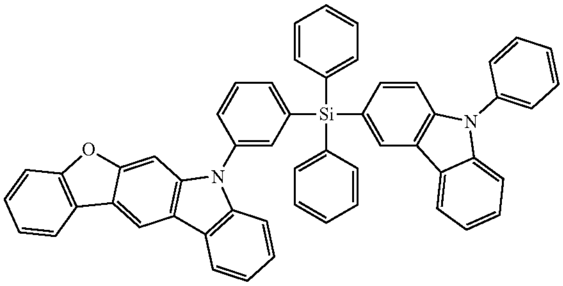
158
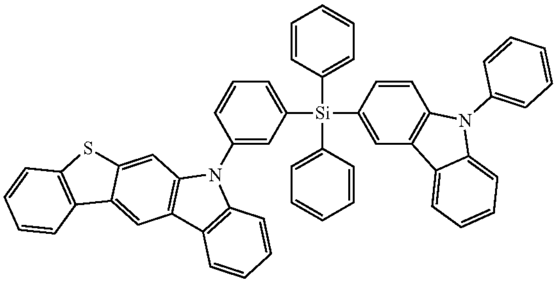
159
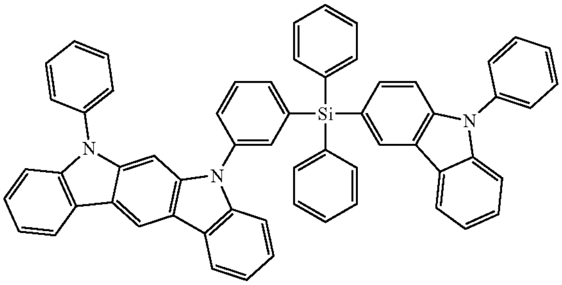
-continued
160
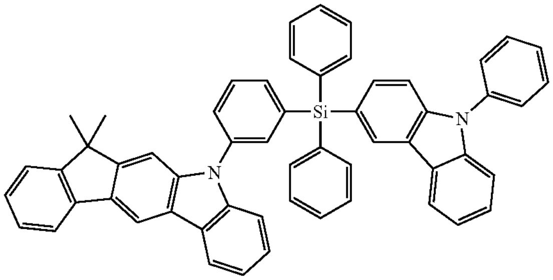
161
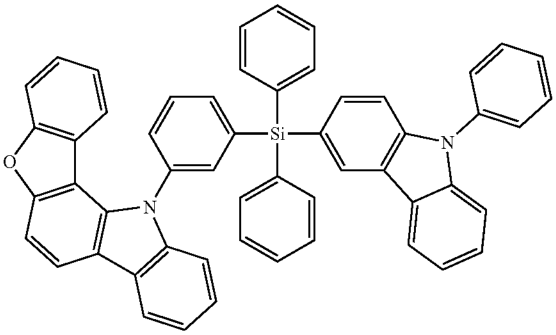
162
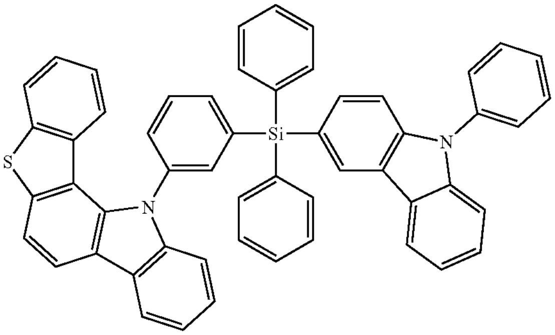
163
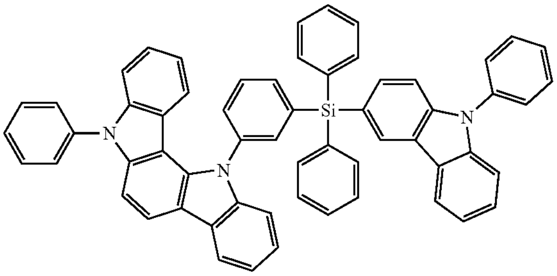

-continued
164
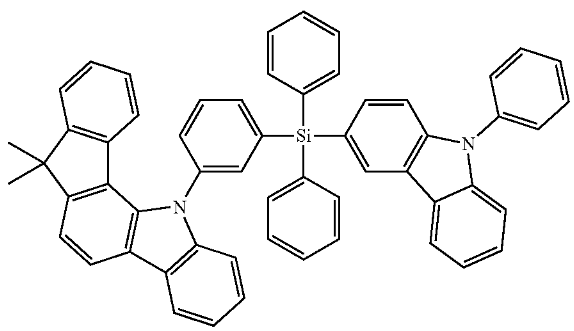
165
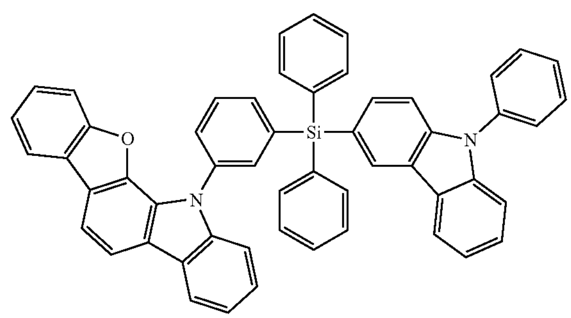
166
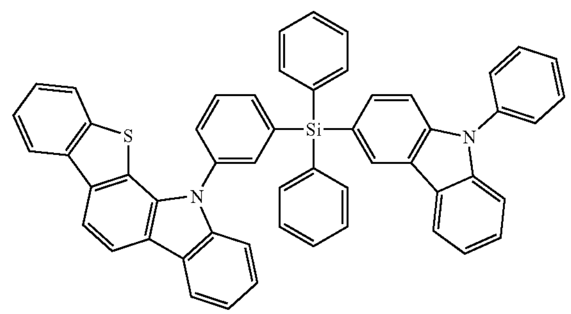
167
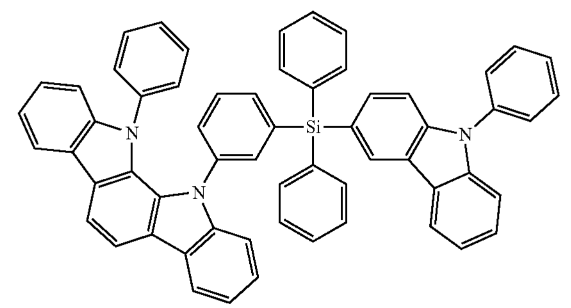
-continued
168
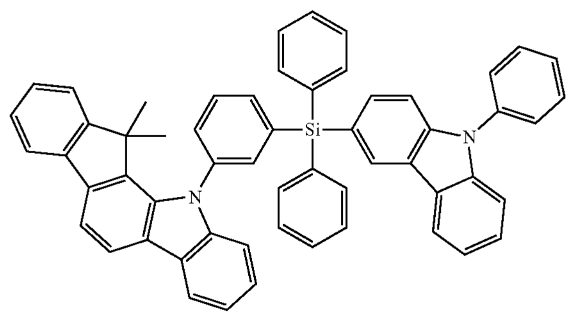
169
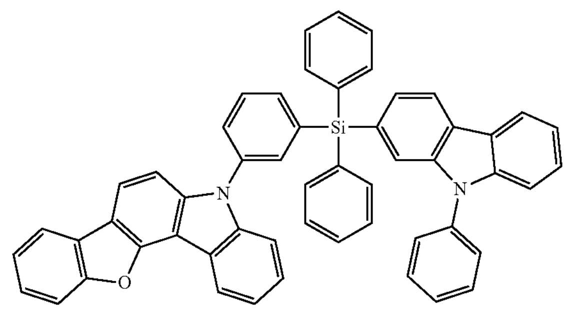
170
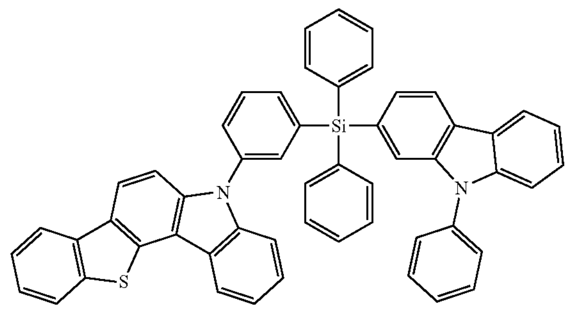
171
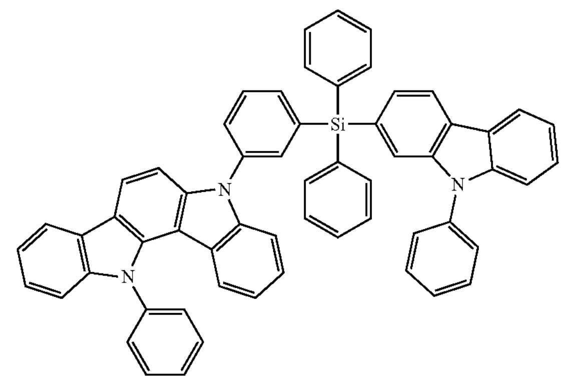

-continued
172
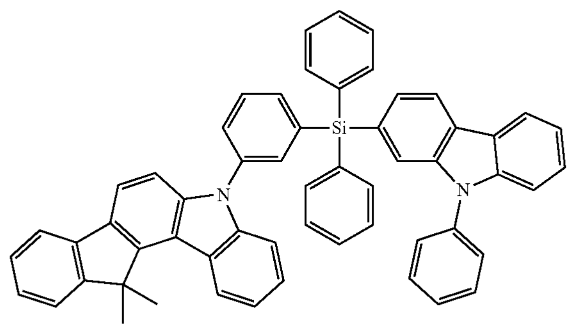
173
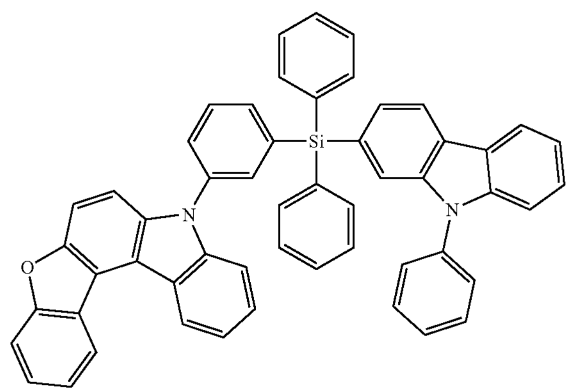
174
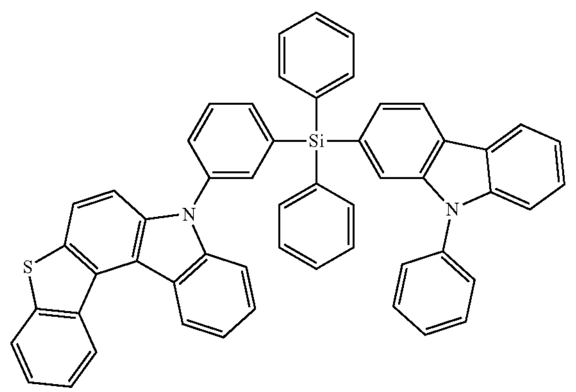
175
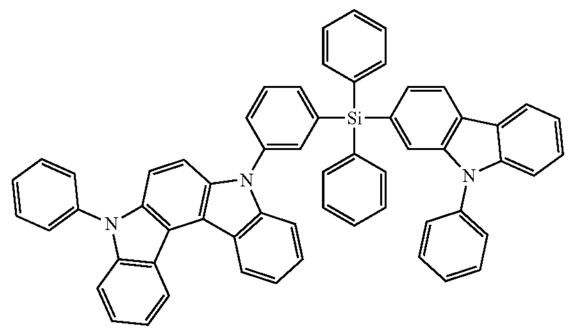
-continued
176
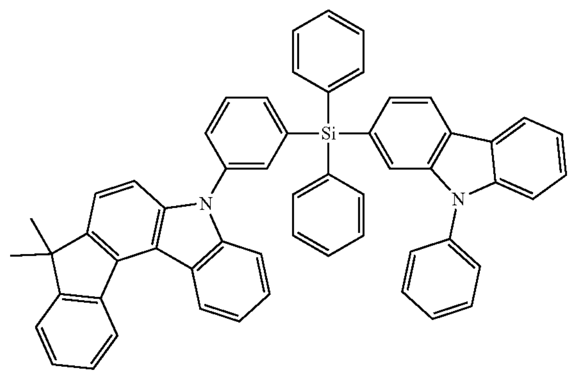
177
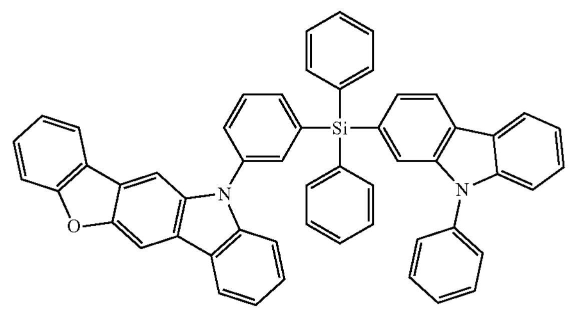
178
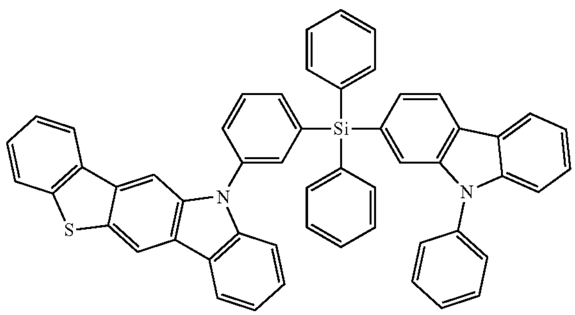
179
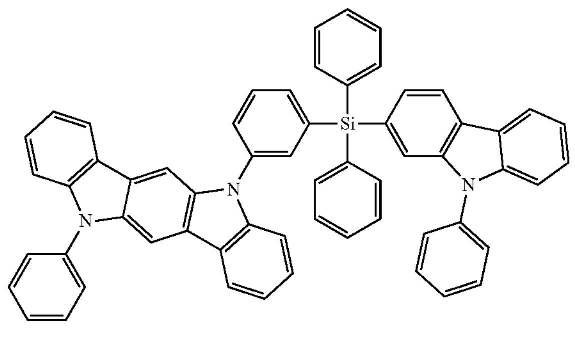

180
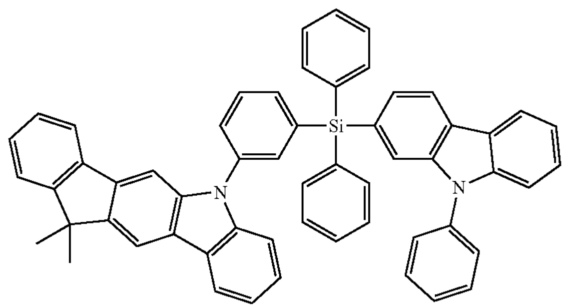
181
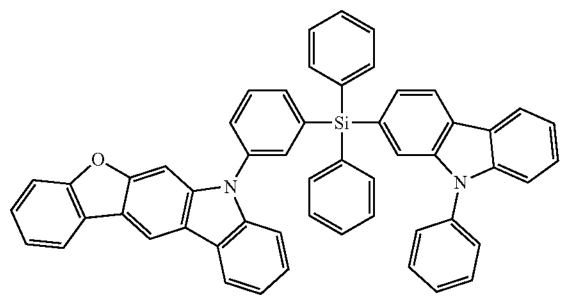
182
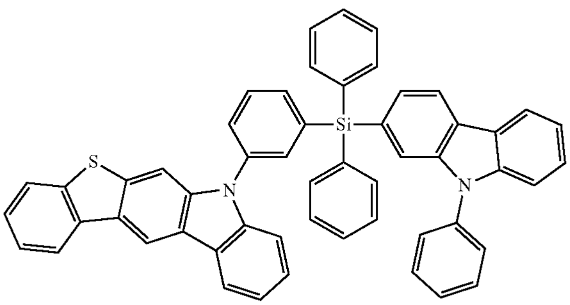
183
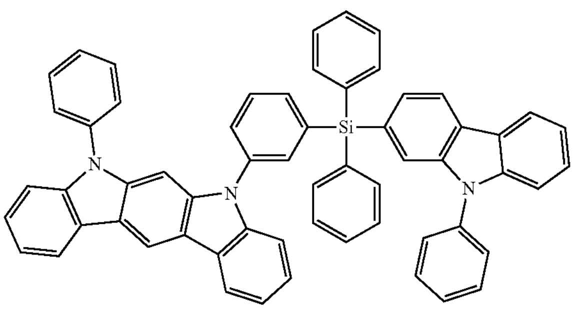
184
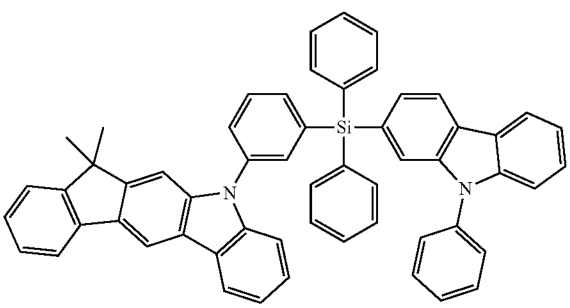
185
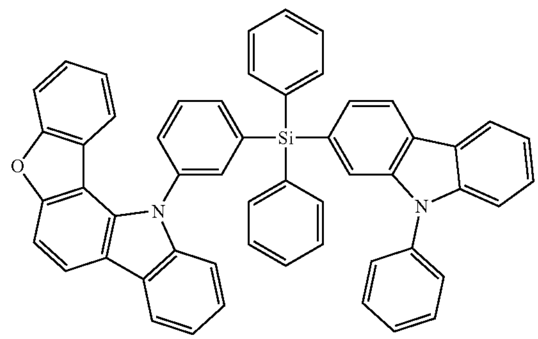
186
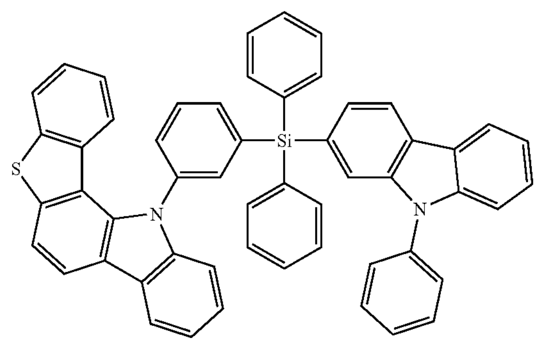
187
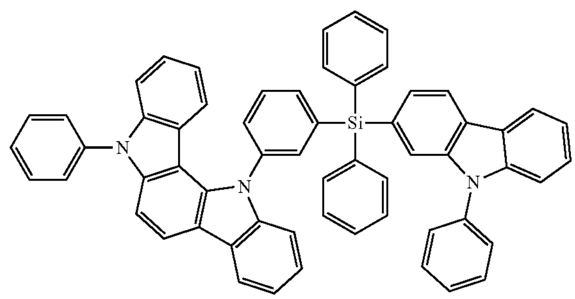
188
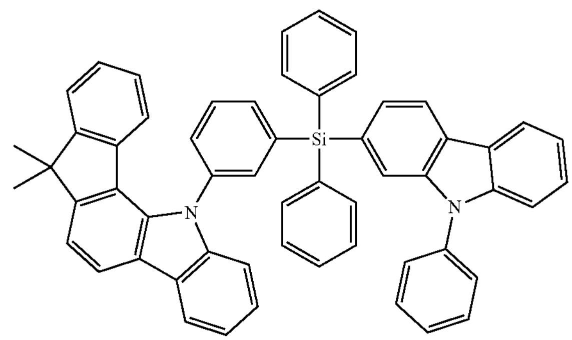

-continued
189
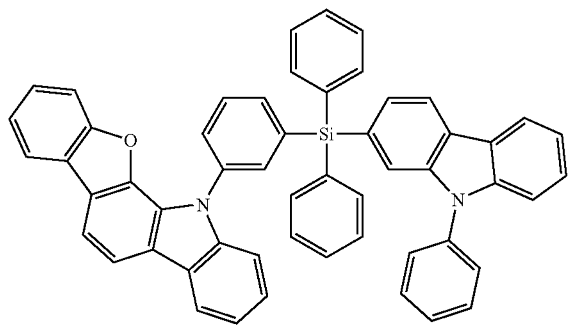
190
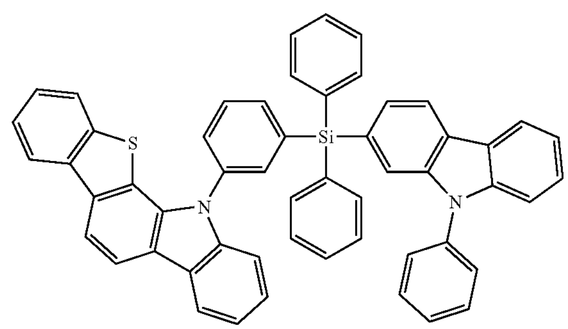
191
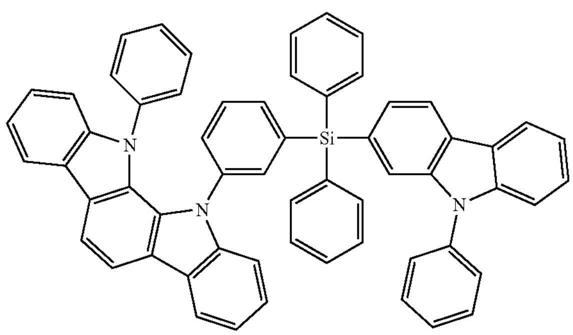
192
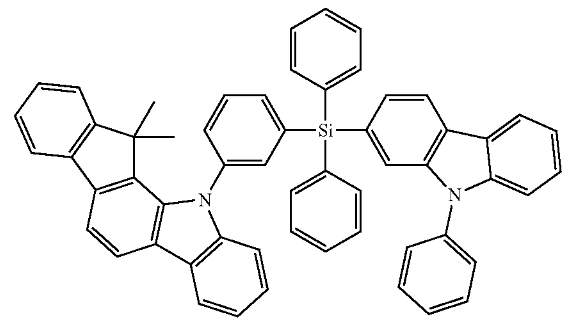
-continued
193
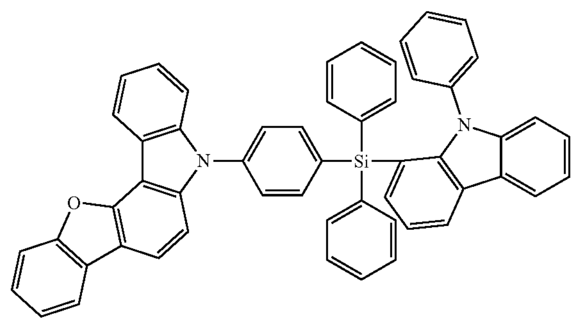
194
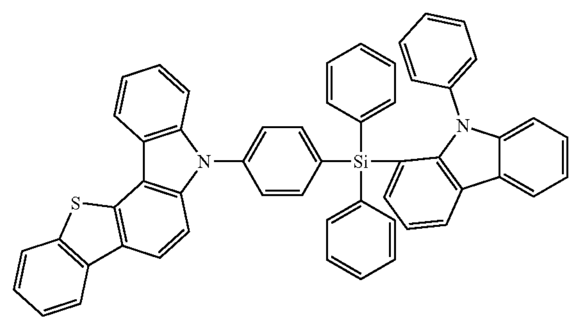
195
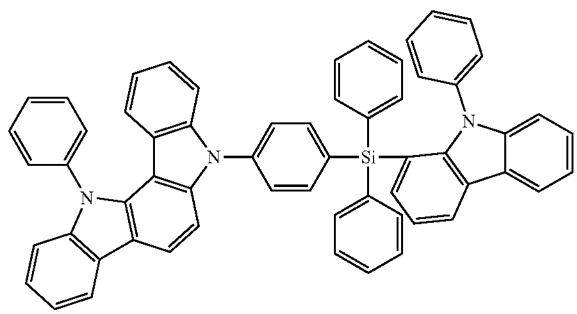
196
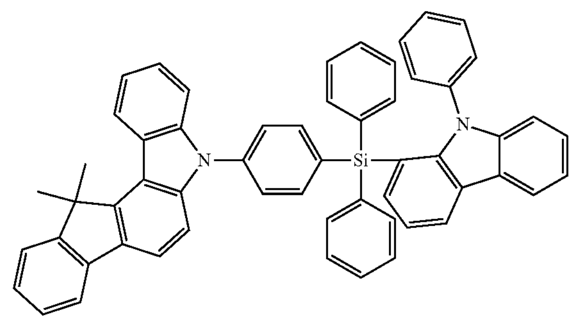
197
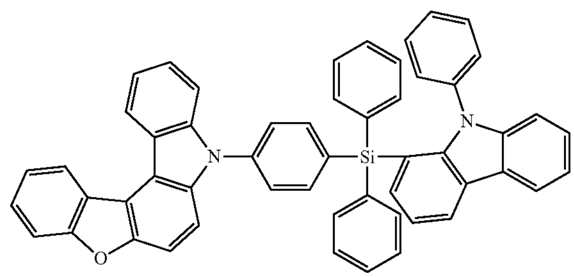

-continued
198
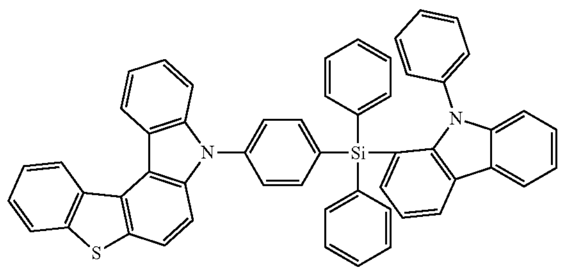
199
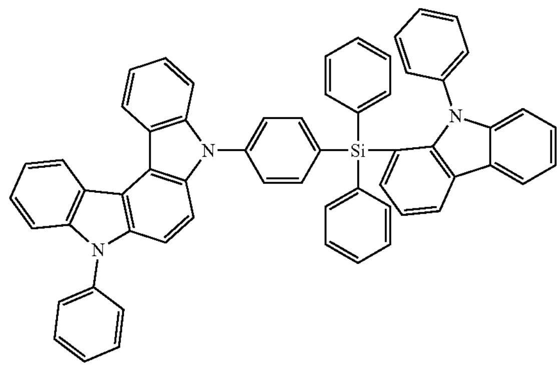
200
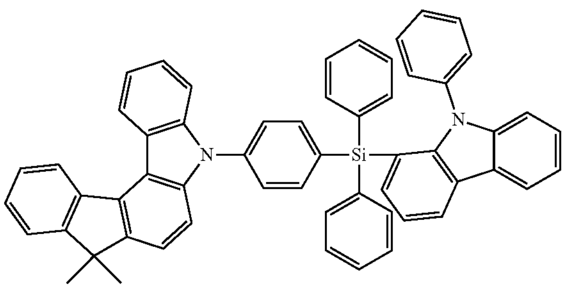
201
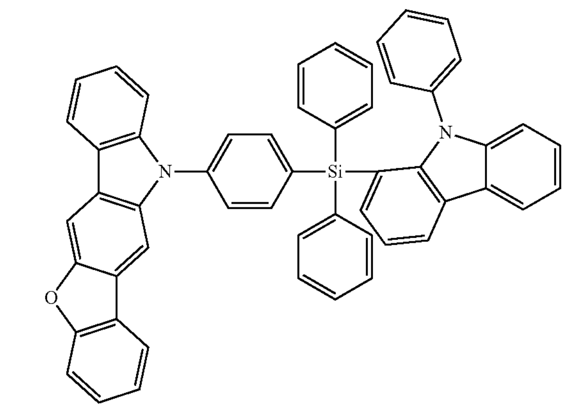
-continued
202
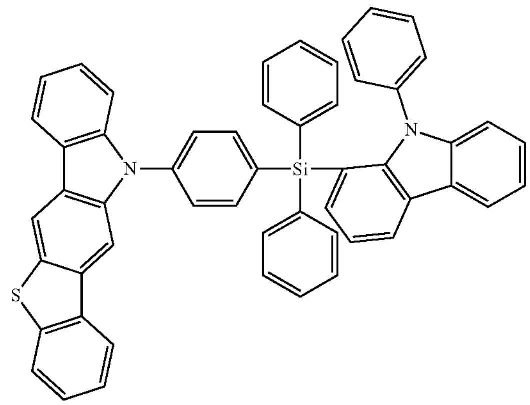
203
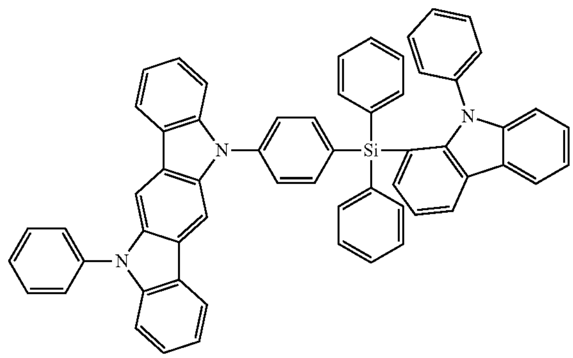
204
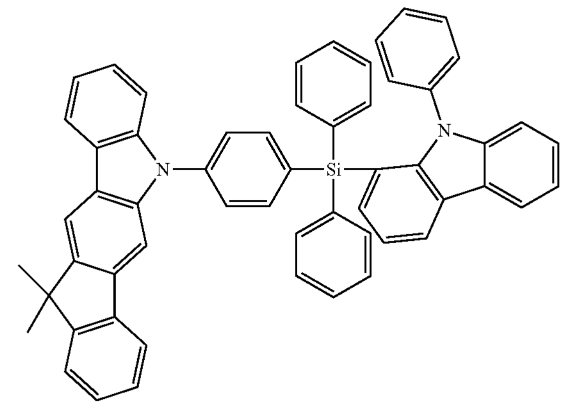
205
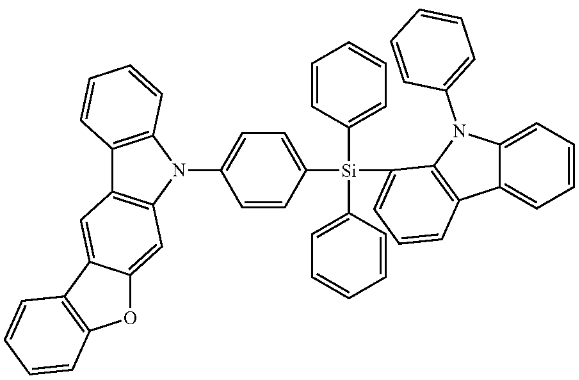

-continued
206
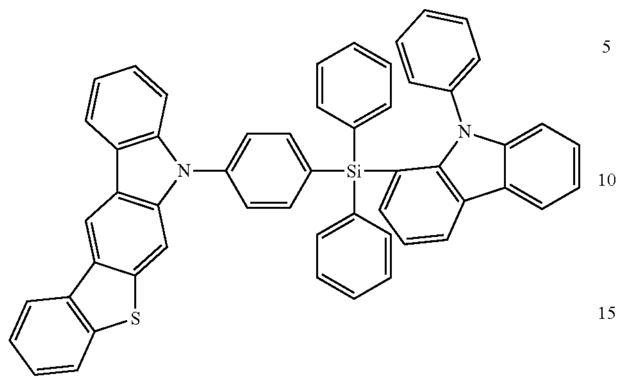
207
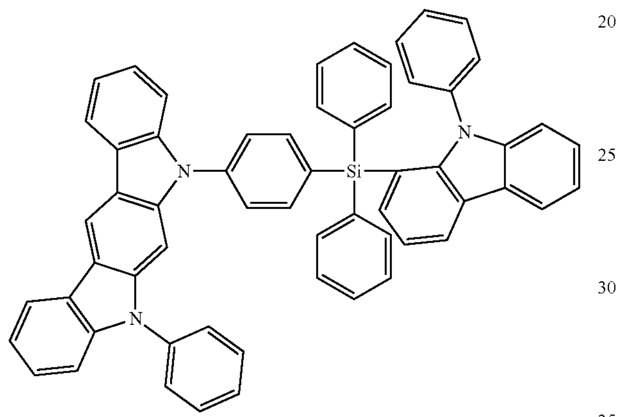
208
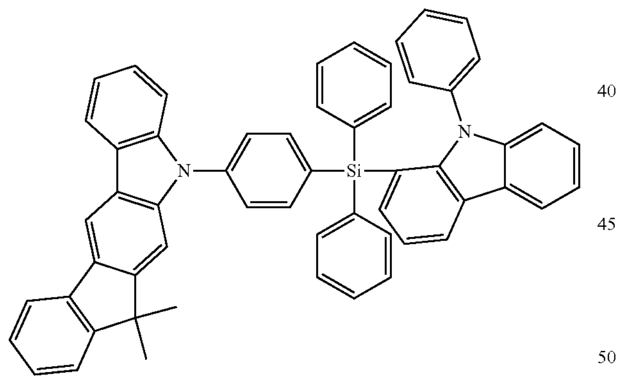
209
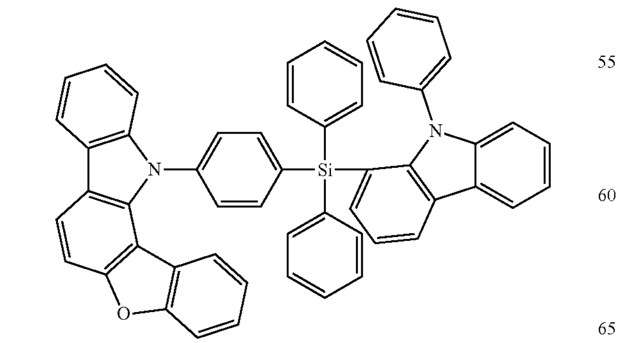
-continued
210
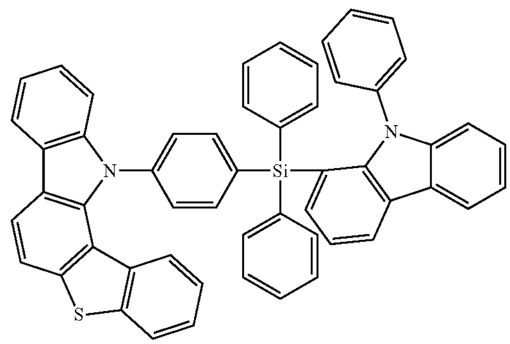
211
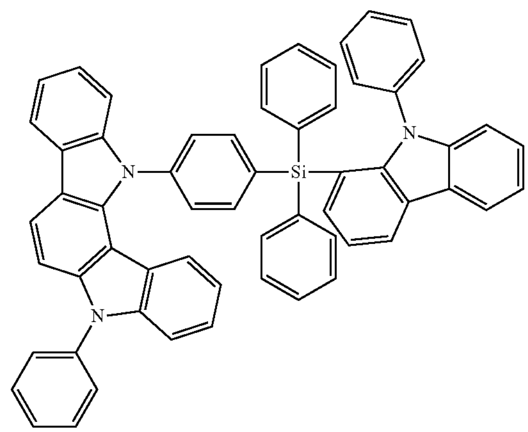
212
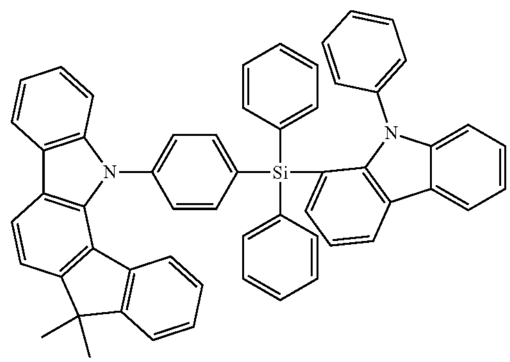
213
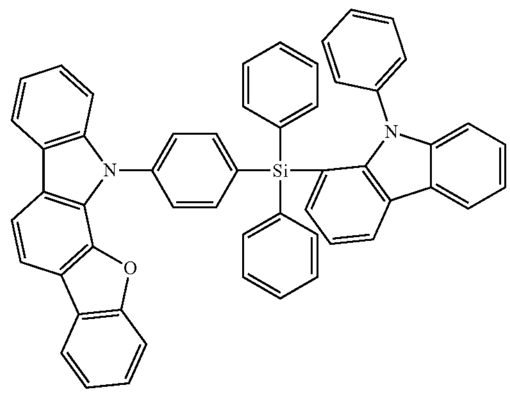

-continued
214
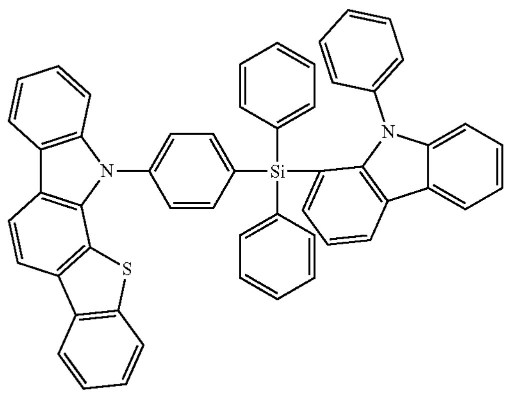
215
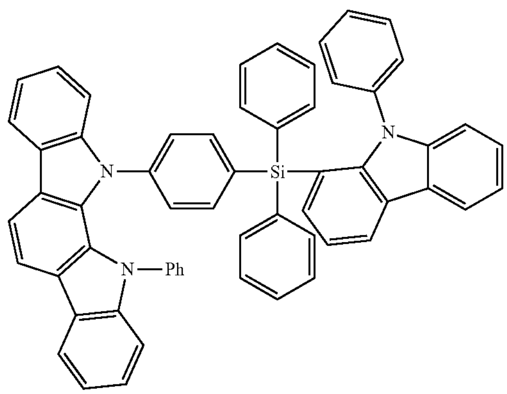
216
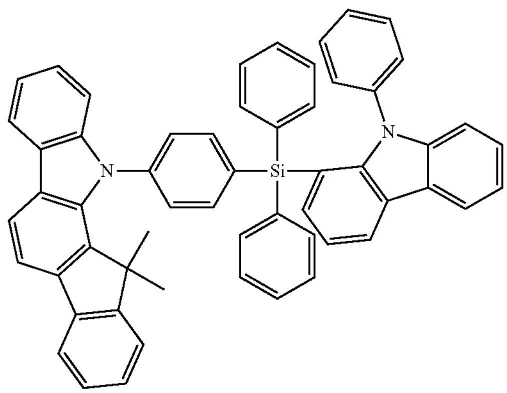
217
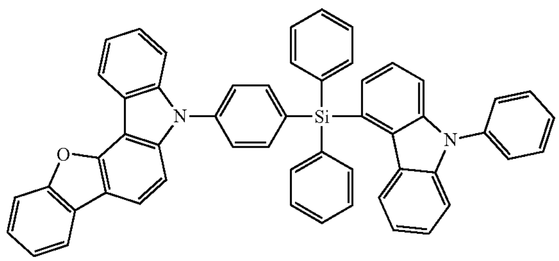
-continued
218
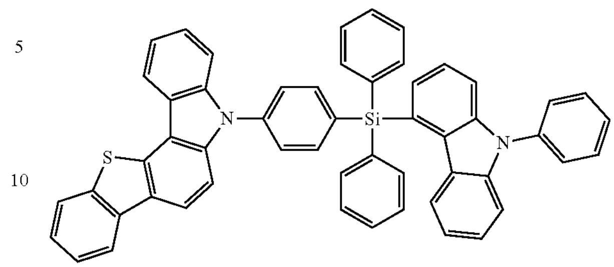
219
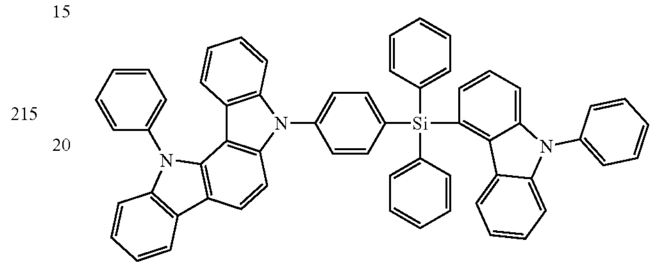
220
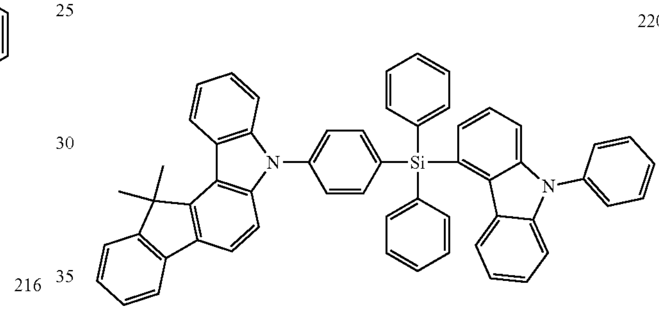
221
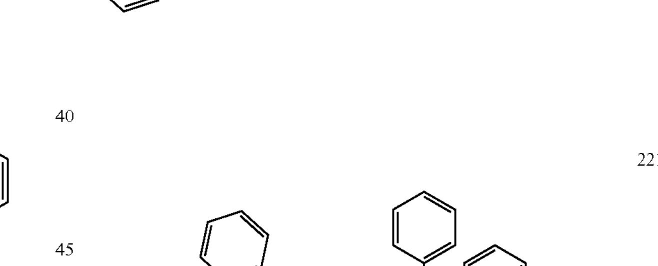
222
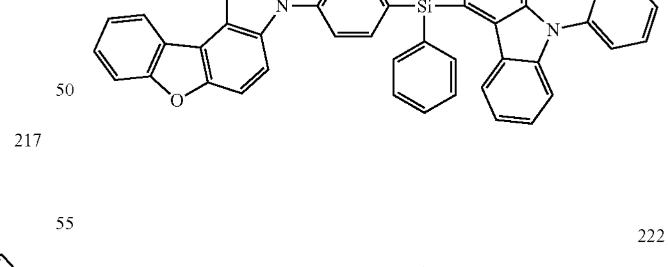
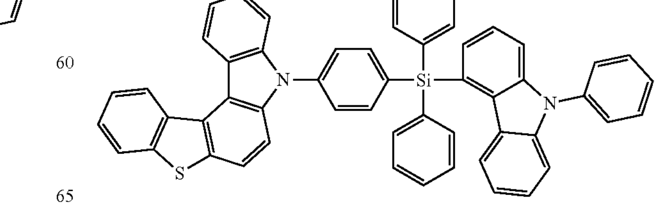

-continued
223
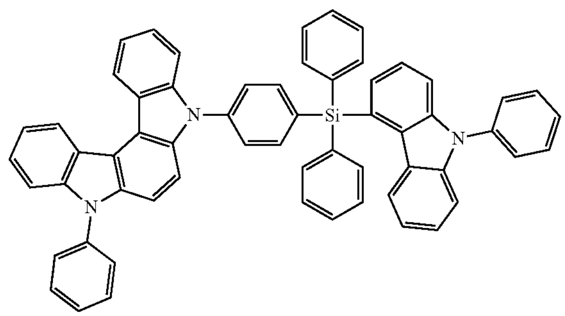
-continued
224
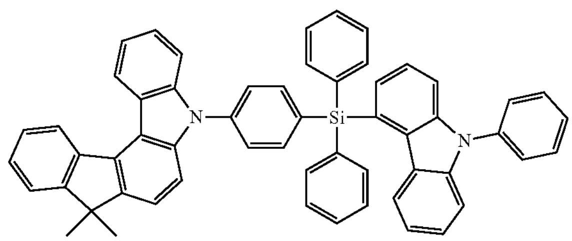
225
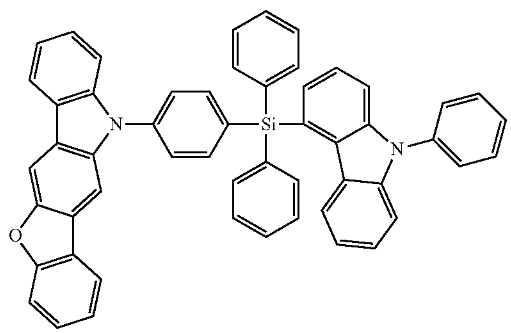
226
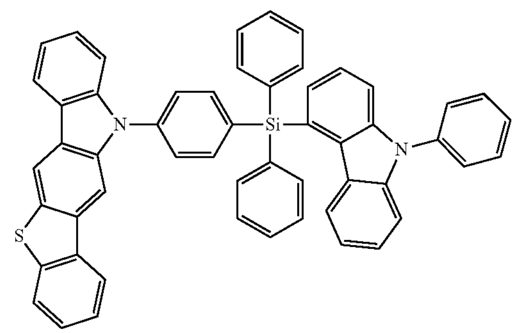
227
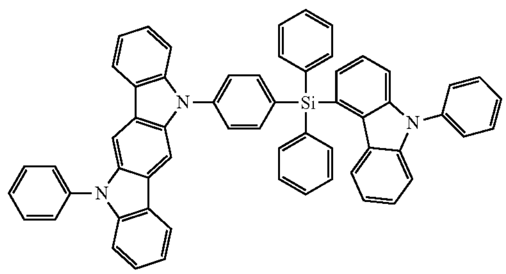
228
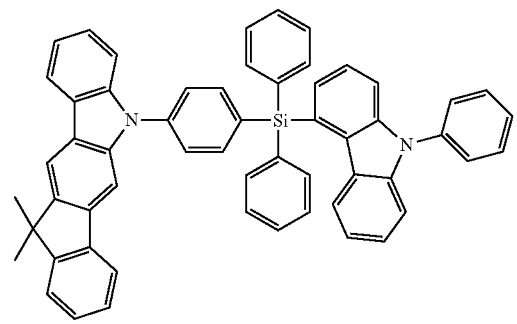
229
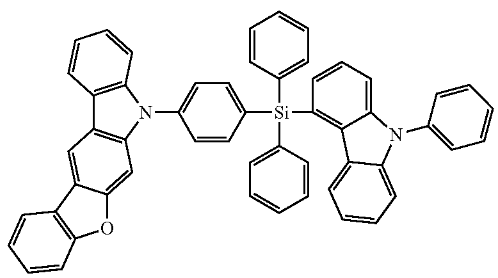
230
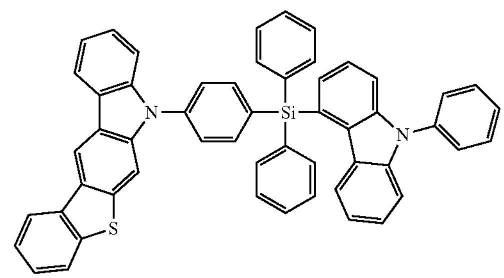

-continued
231
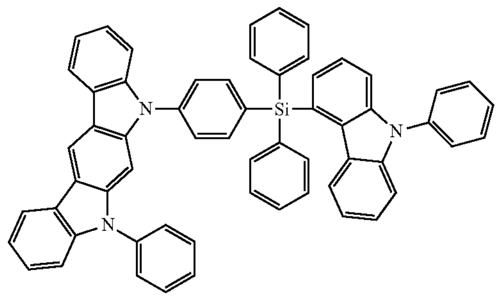
232
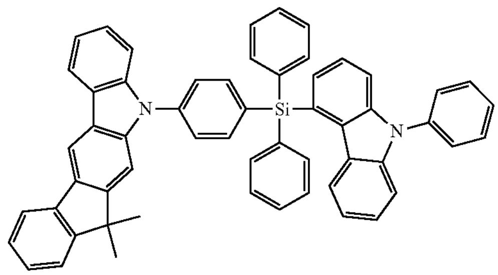
233
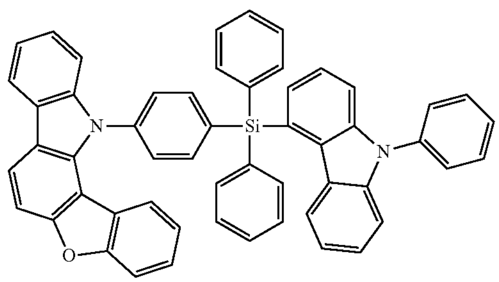
234
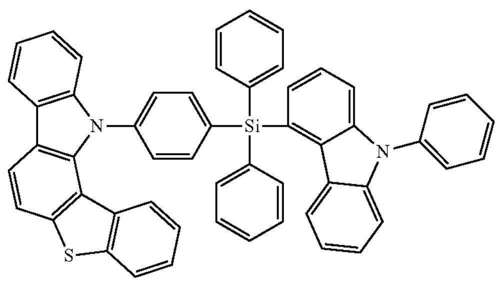
235
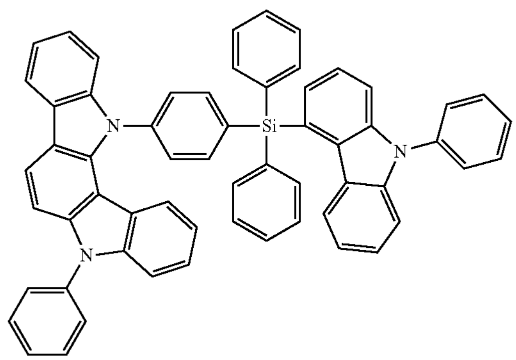
236
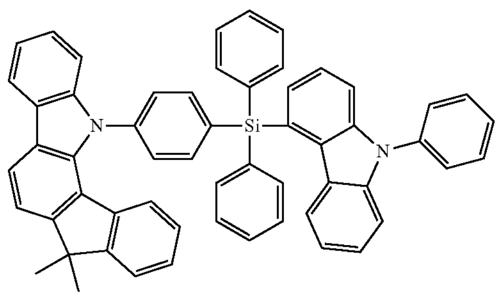
237
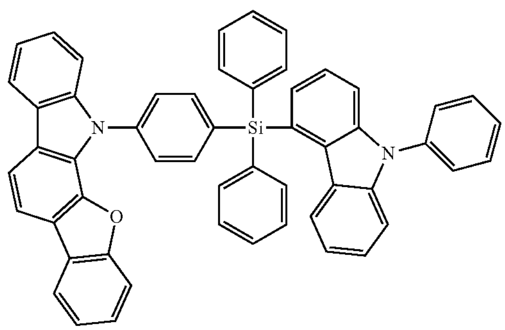
238
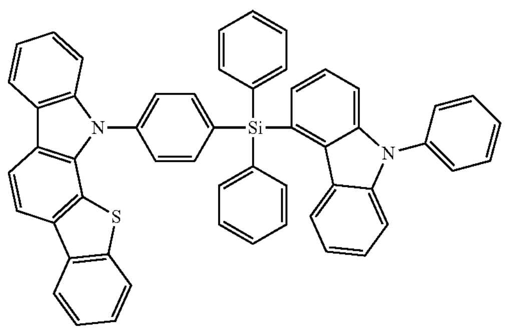
239
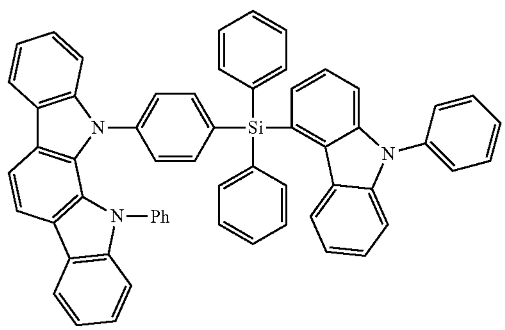
240
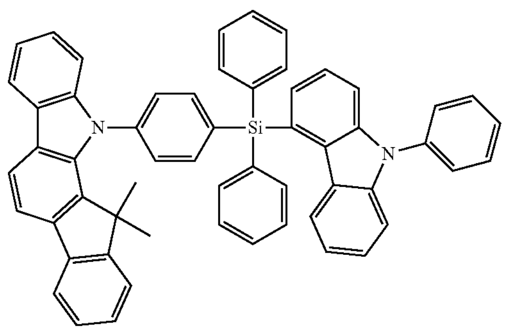

-continued
241
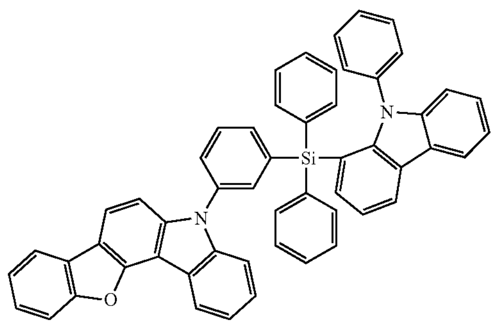
242
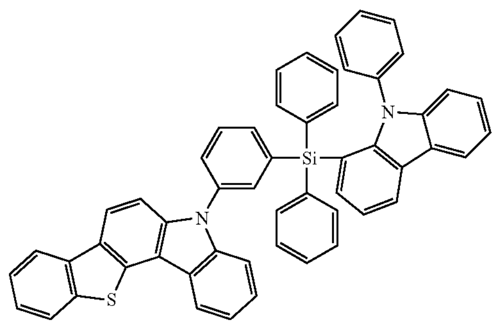
243
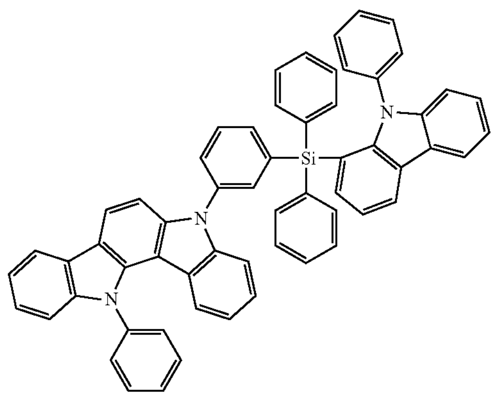
244
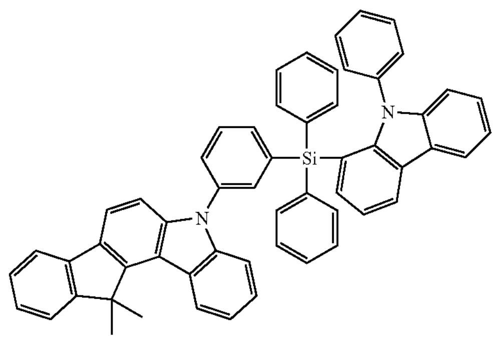
245
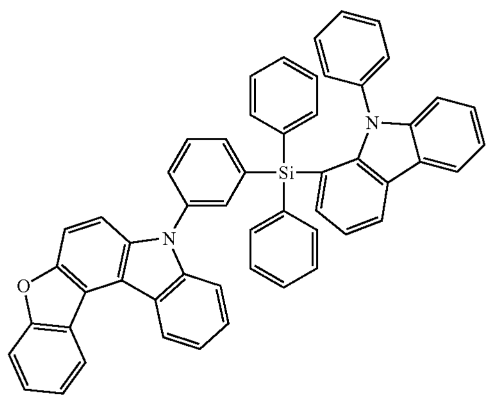
246
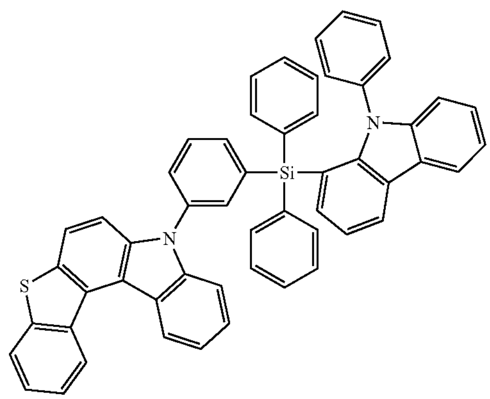
247
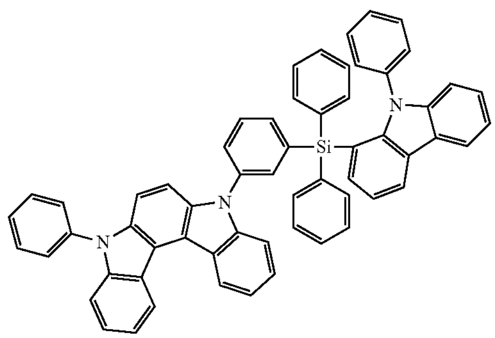
248
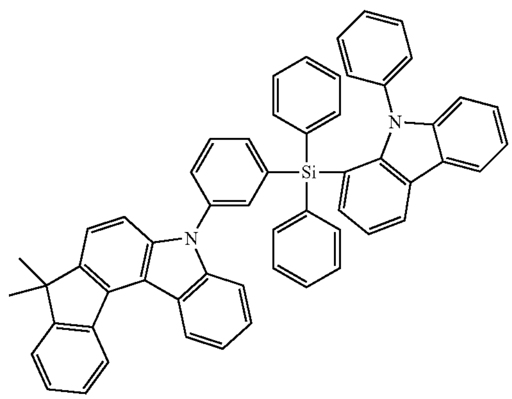

-continued
249
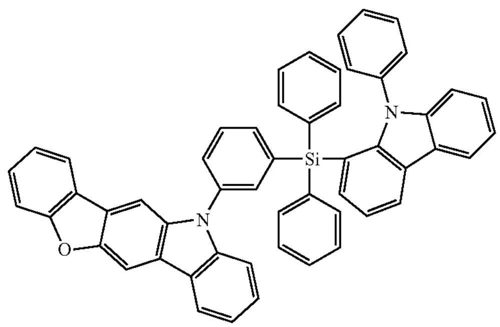
250
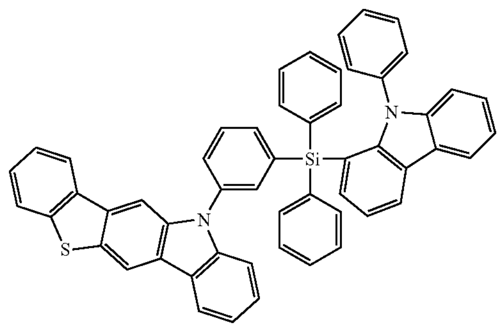
251
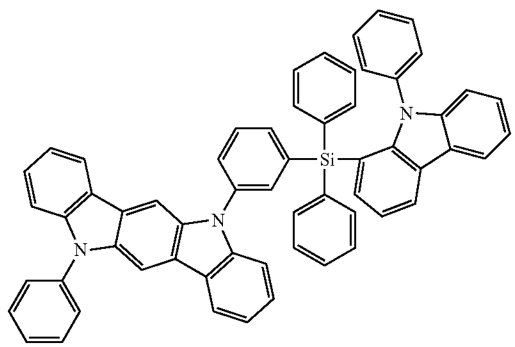
252
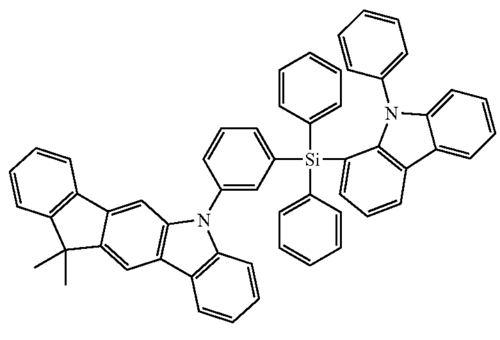
253
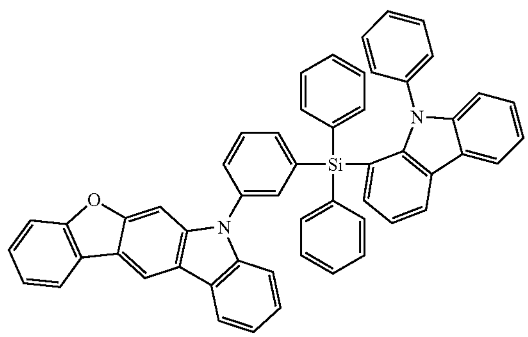
254
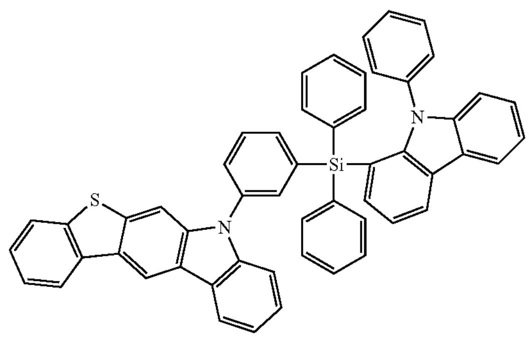
255
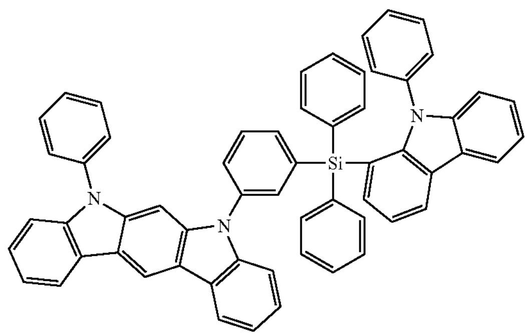
256
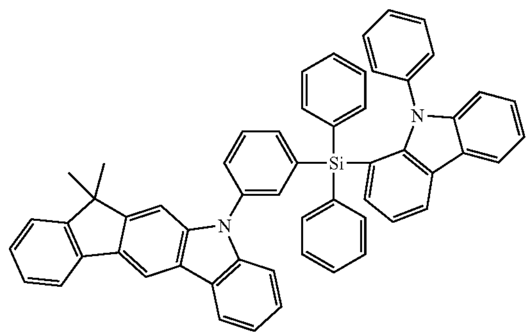

-continued
257
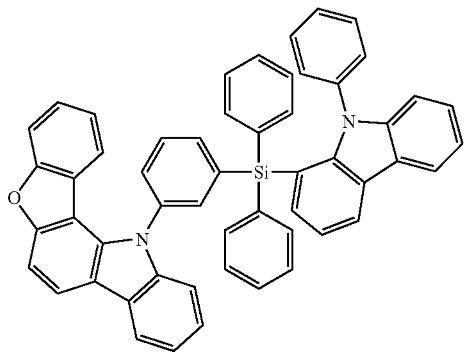
258
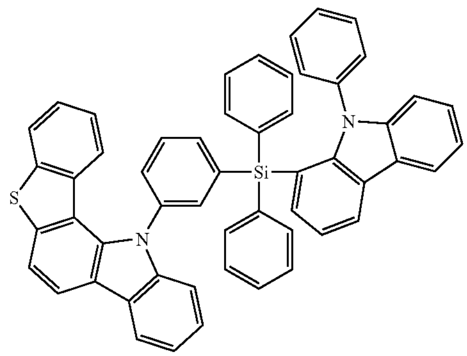
259
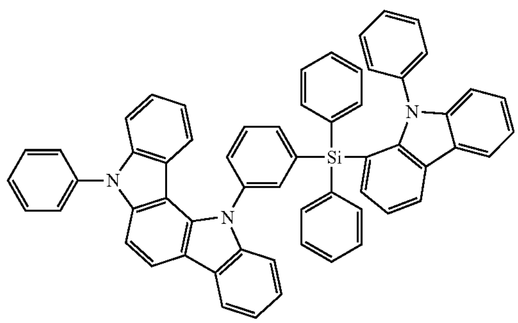
260
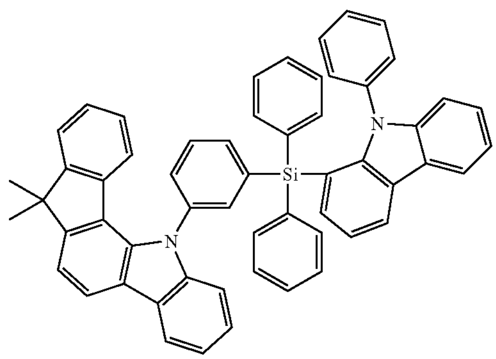
261
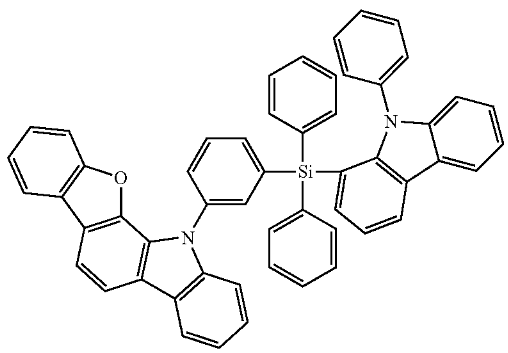
262
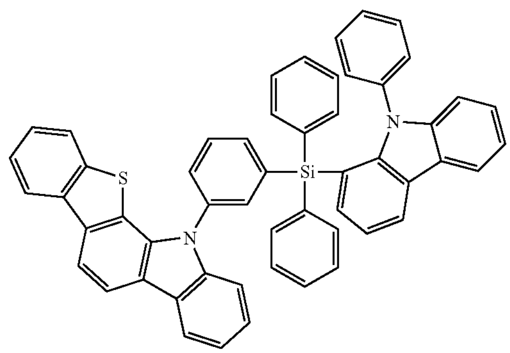
263
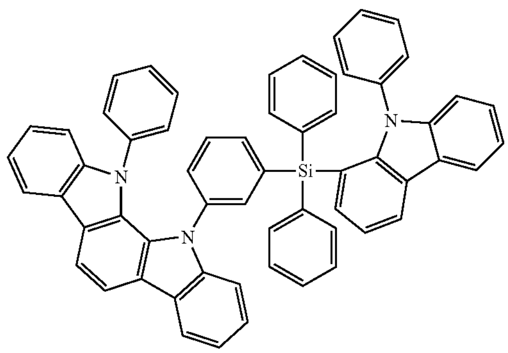
264
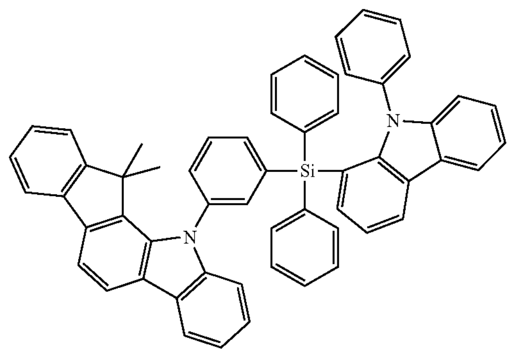

-continued
265
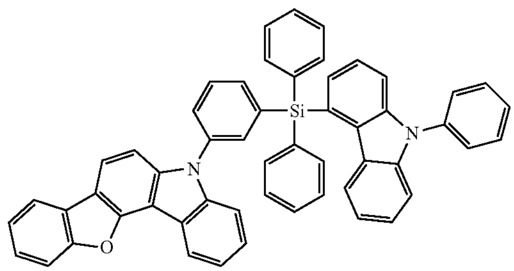
266
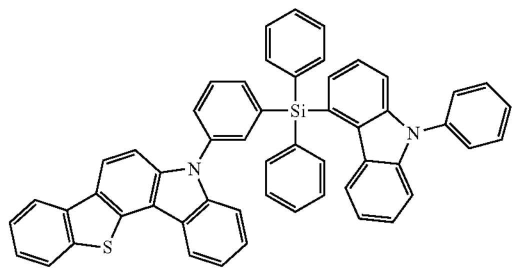
267
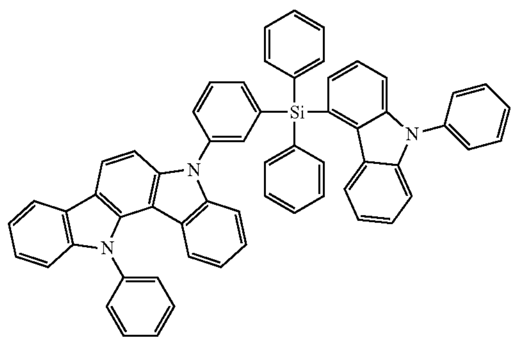
268
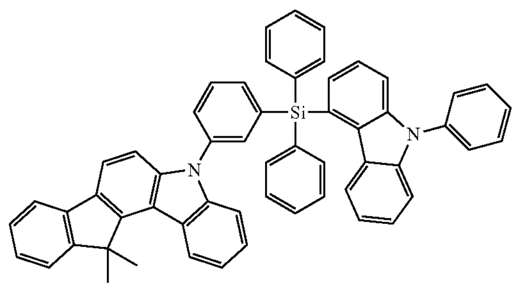
269
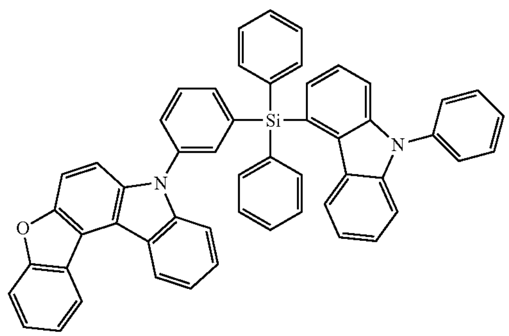
270
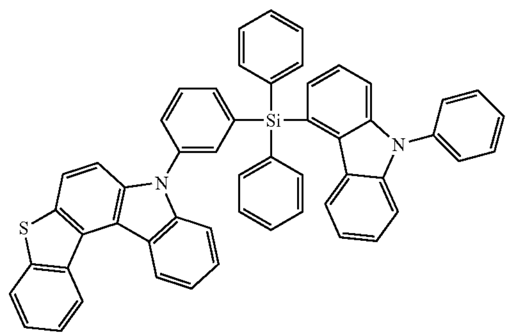
271
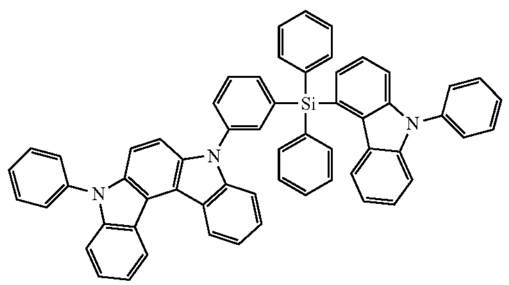
272
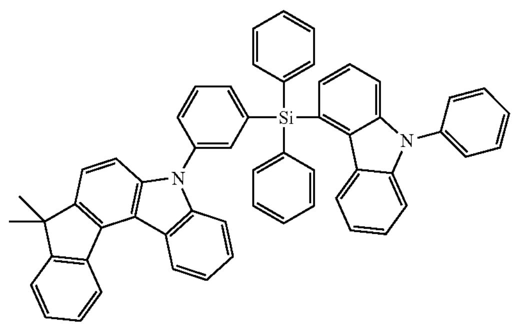
273
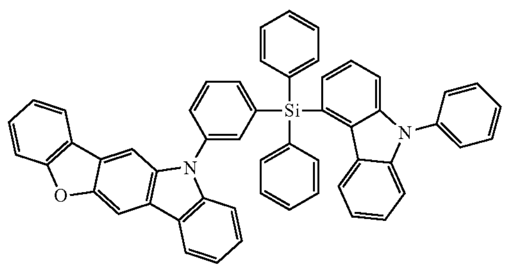
274
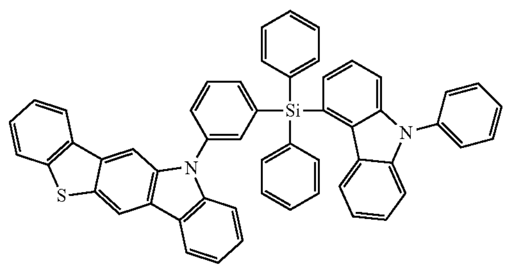

-continued
275
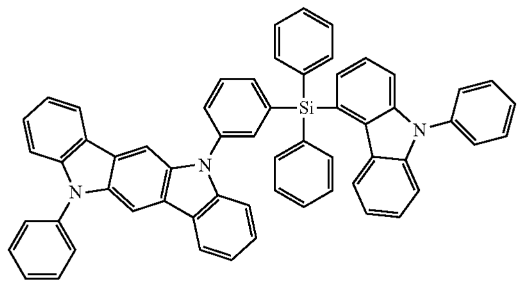
276
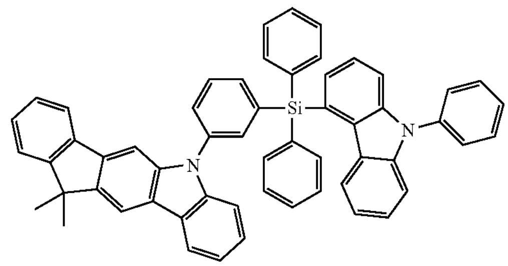
277
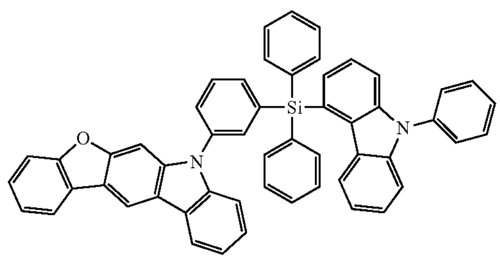
278
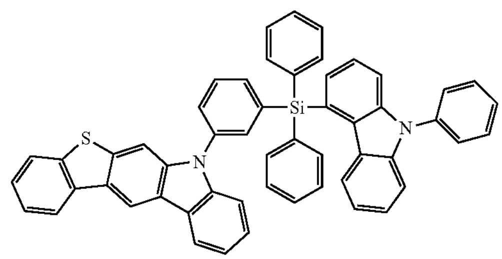
279
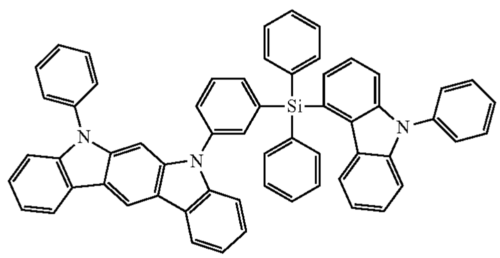
280
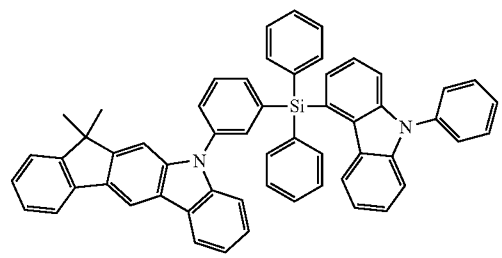
281
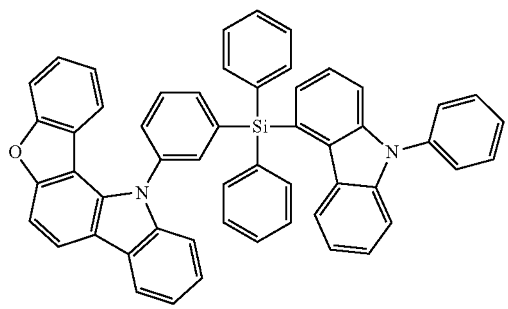
282
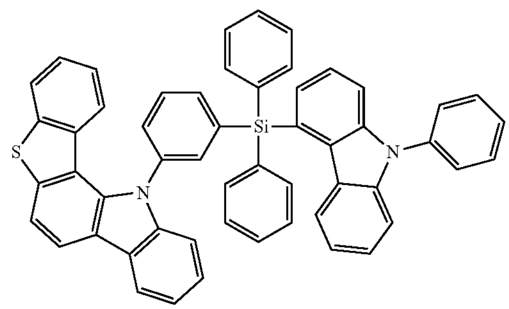
283
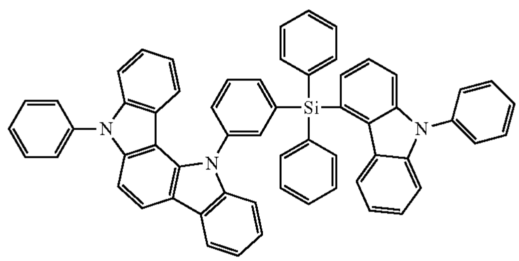
284
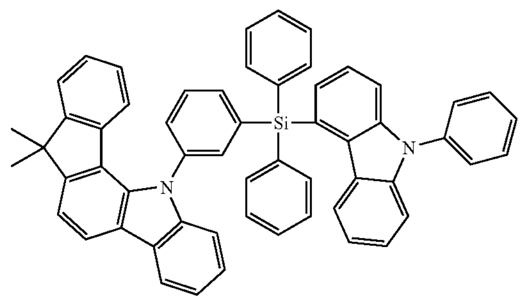

-continued
285
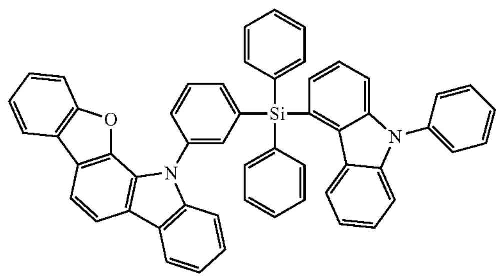
286
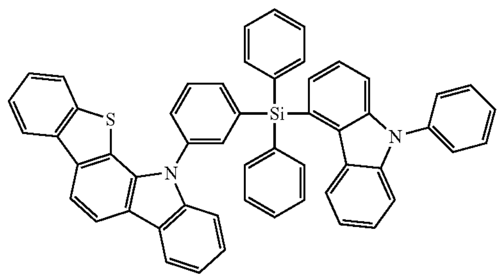
287
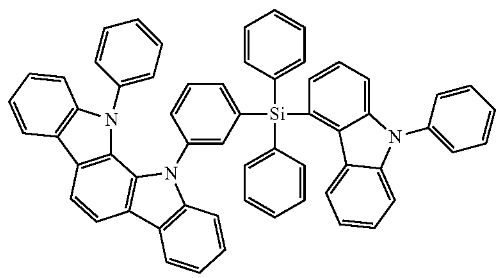
288
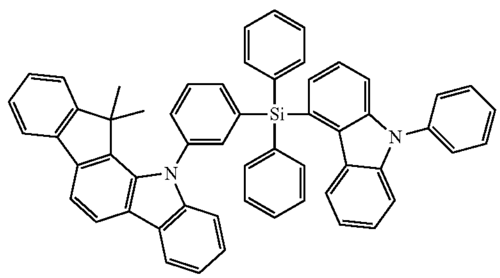
289
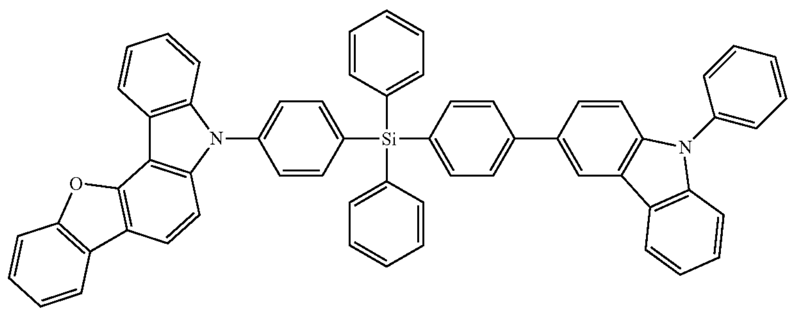
290
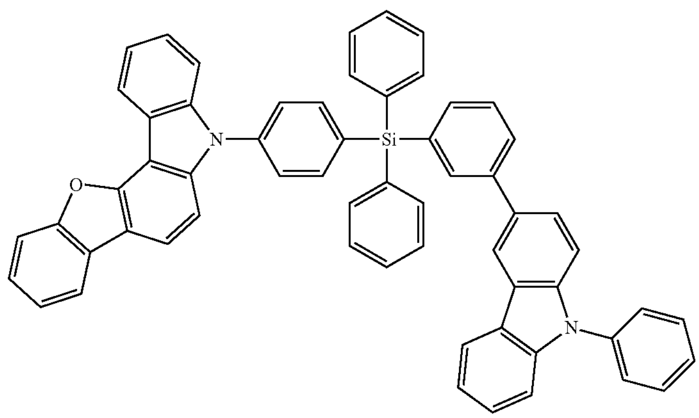
291
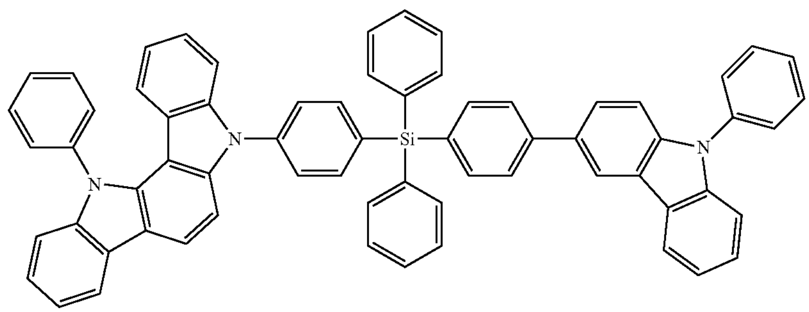

-continued
292
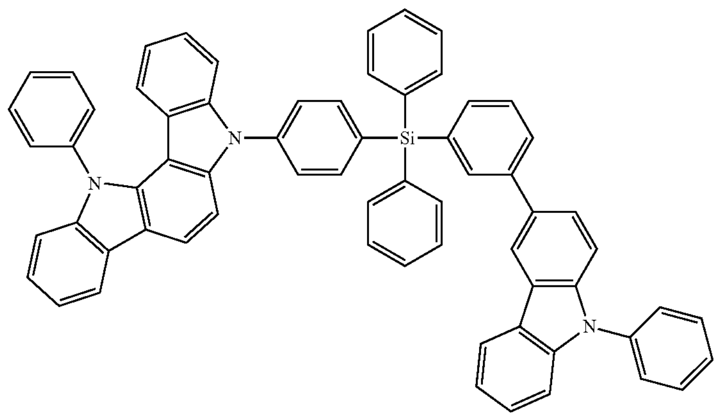
293
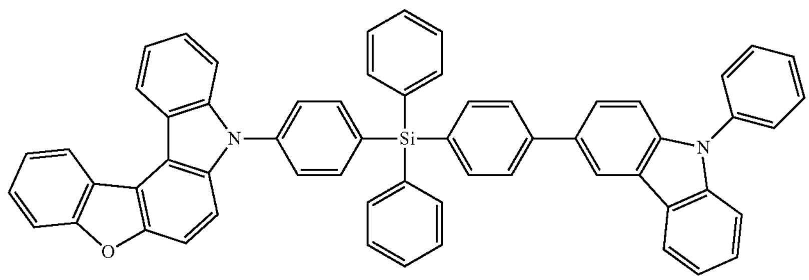
294
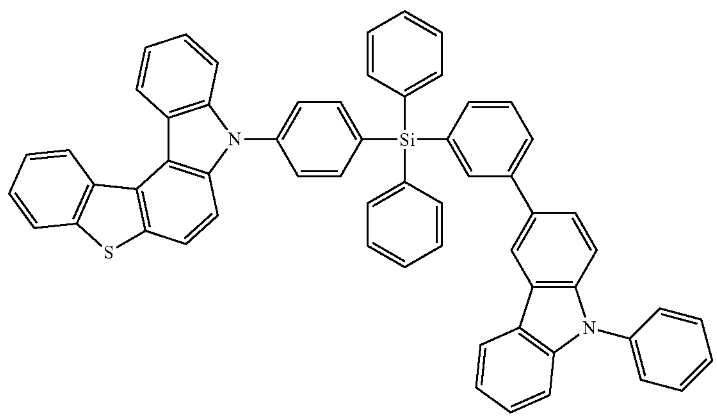
295
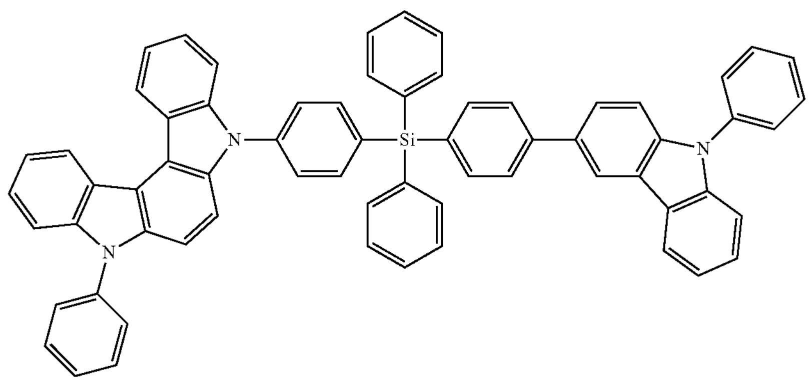

-continued
296
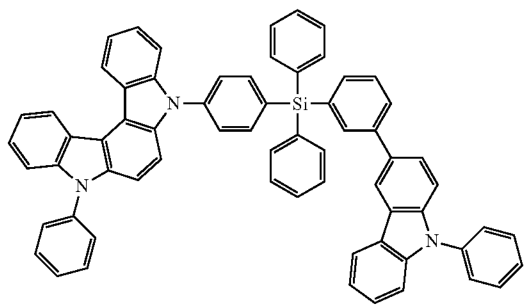
297
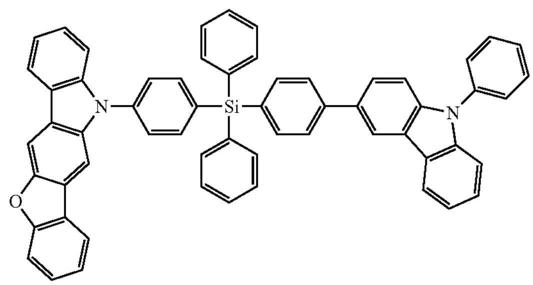
298
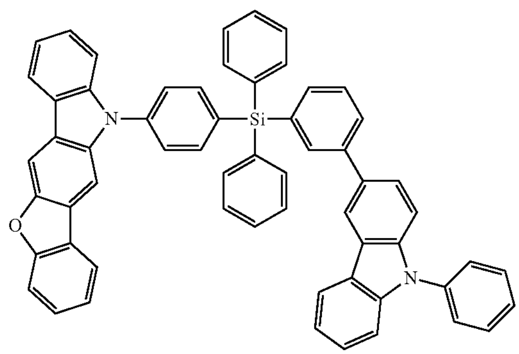
299
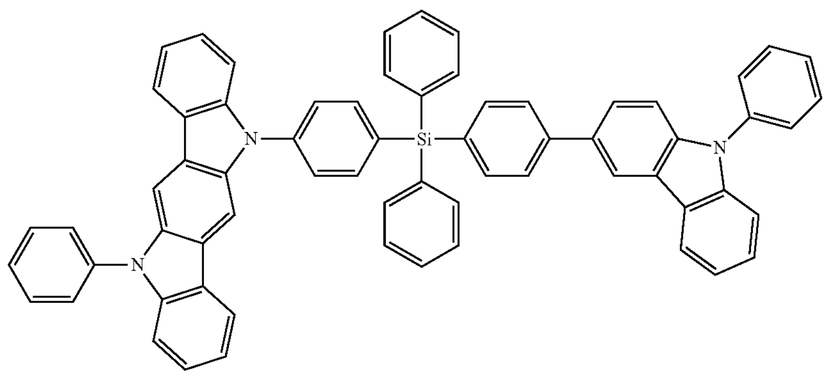
300
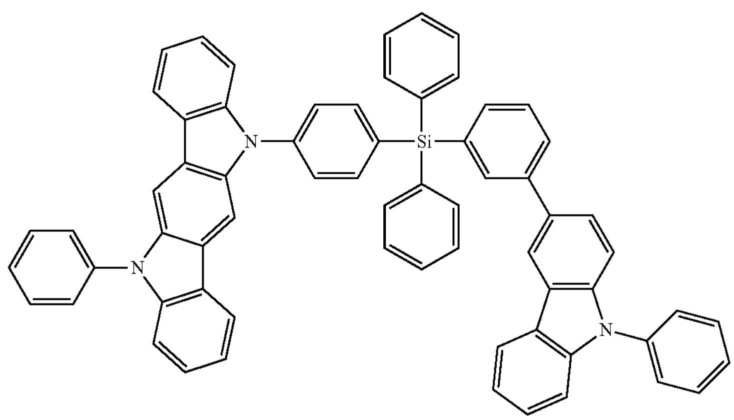

-continued
301
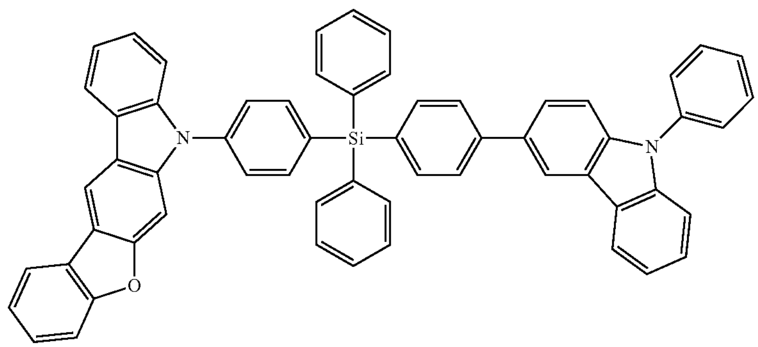
302
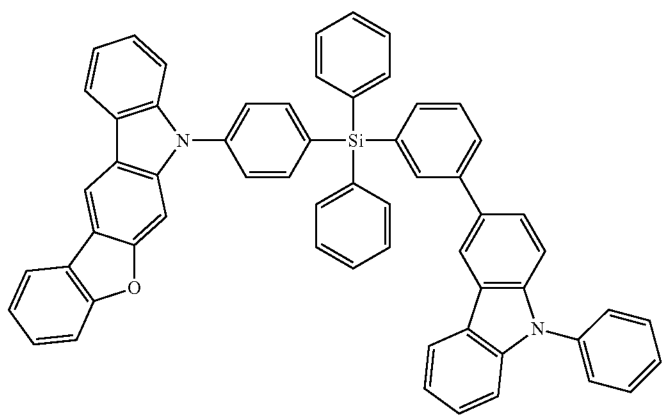
303
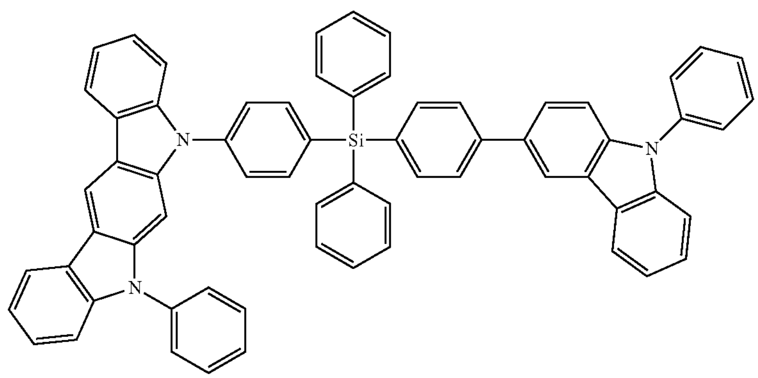
304
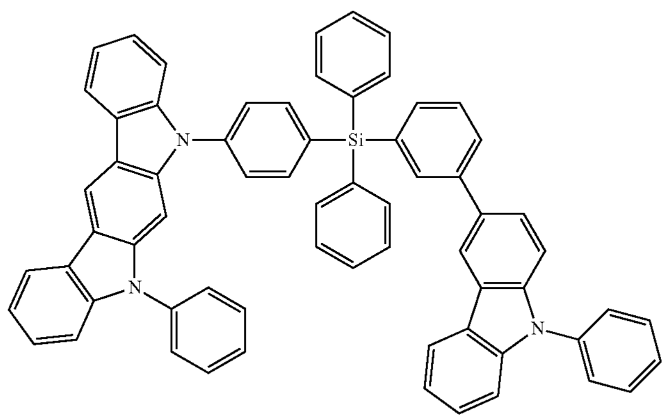

-continued
305
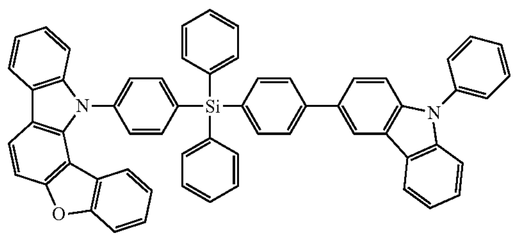
306
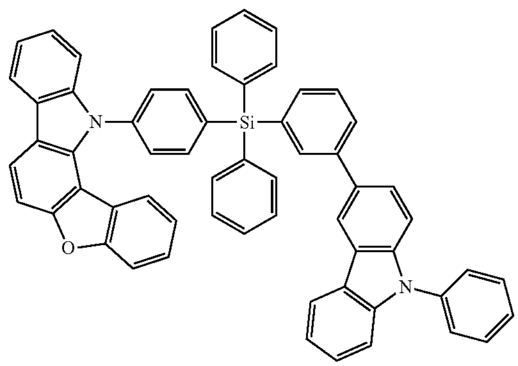
307
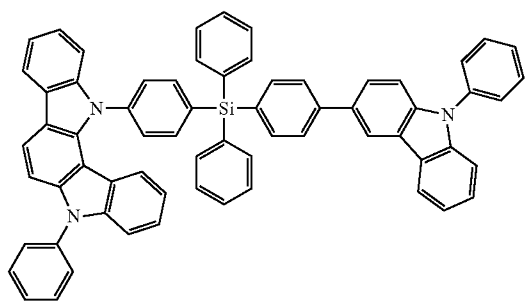
308
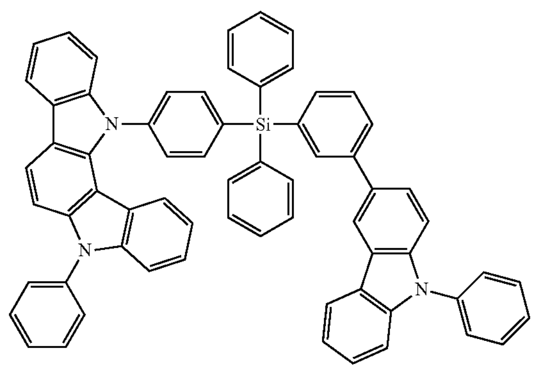
309
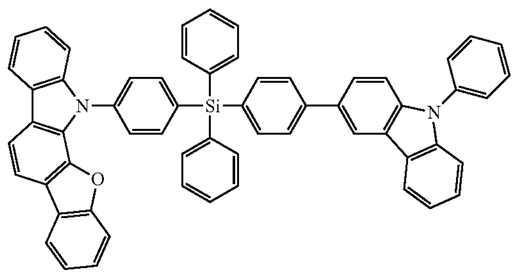
310
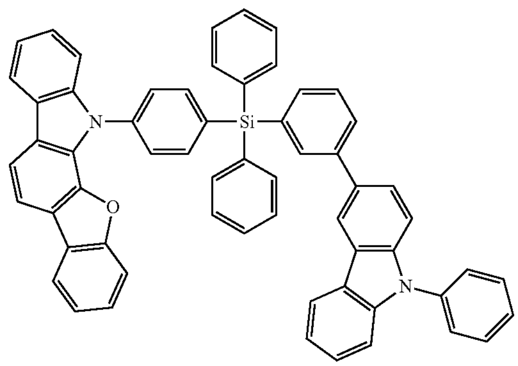
311
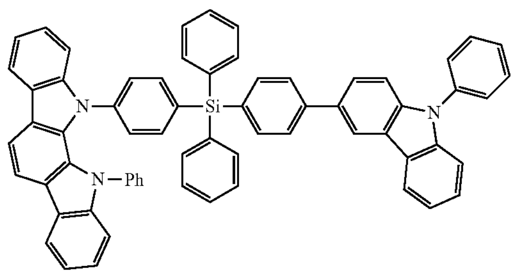
312
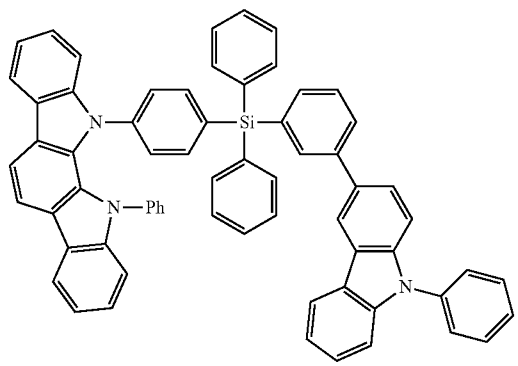

-continued
313
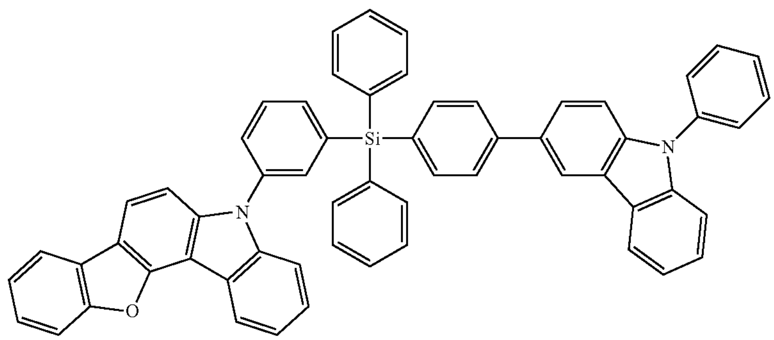
314
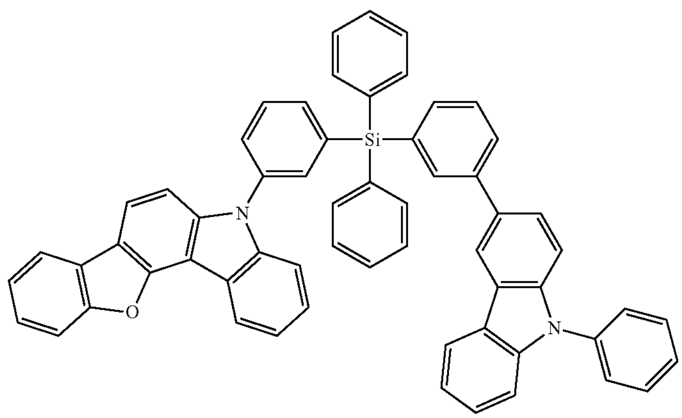
315
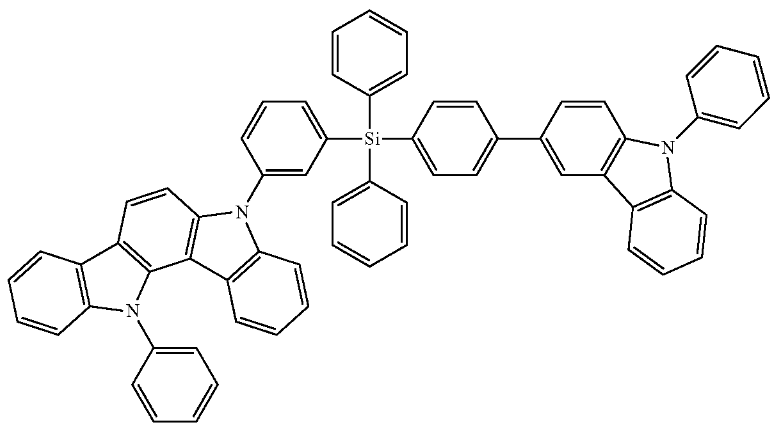
316
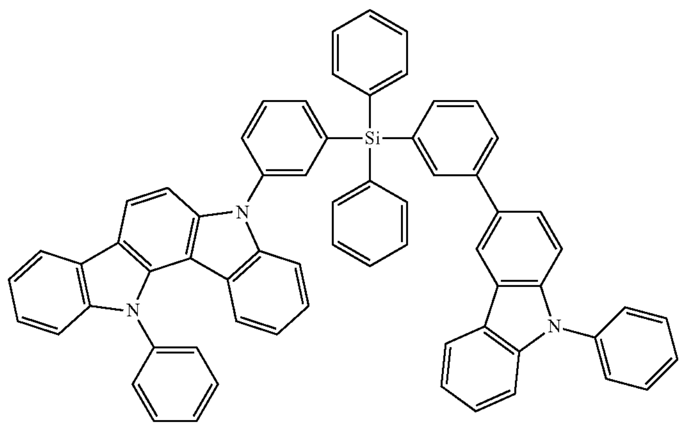

-continued
317
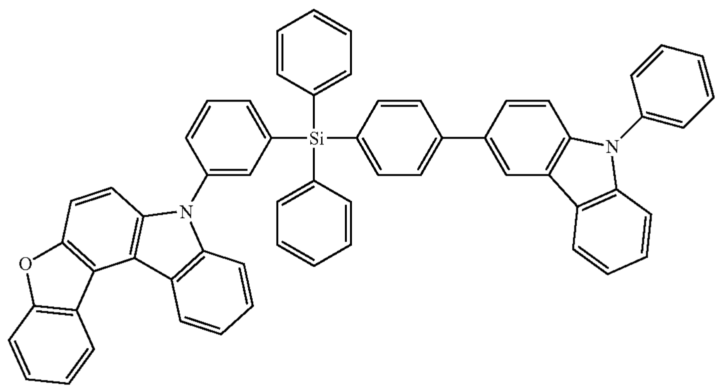
318
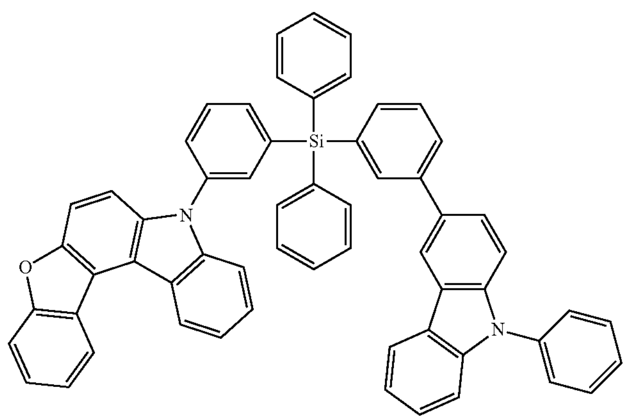
319
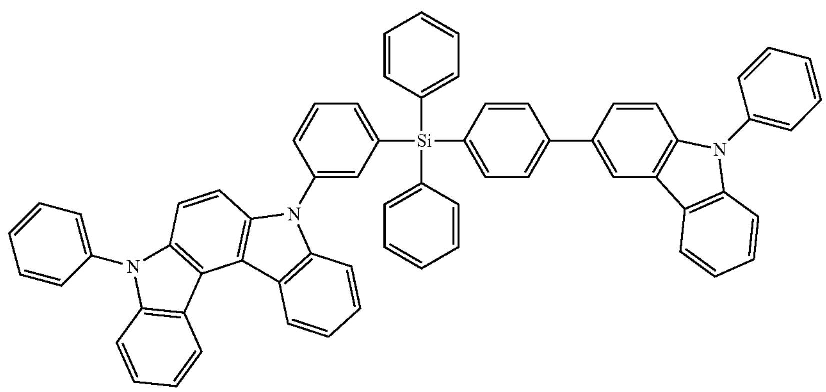
320
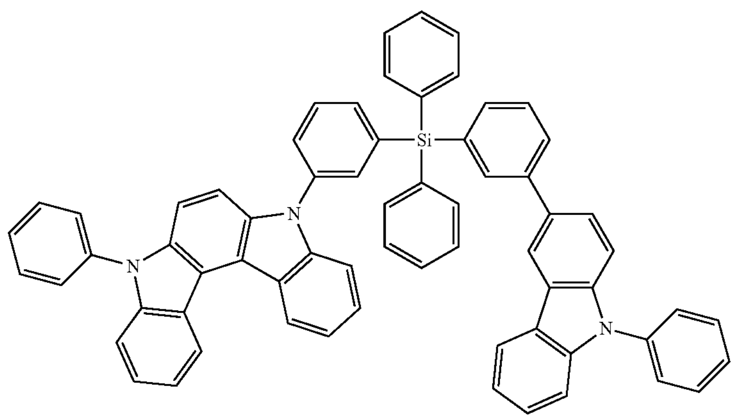

-continued
321
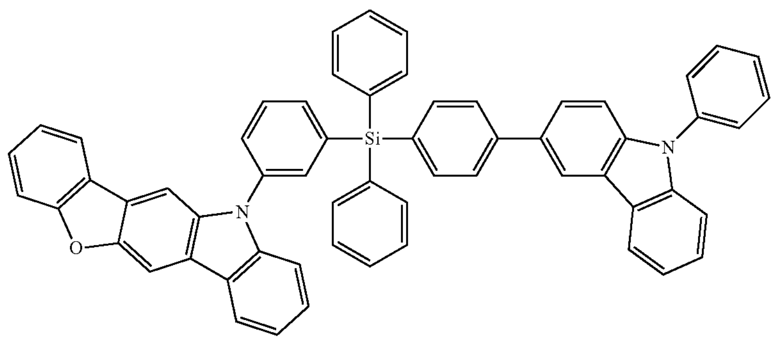
322
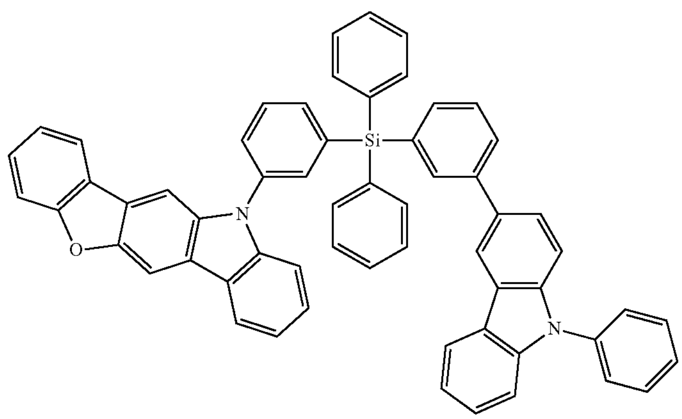
323
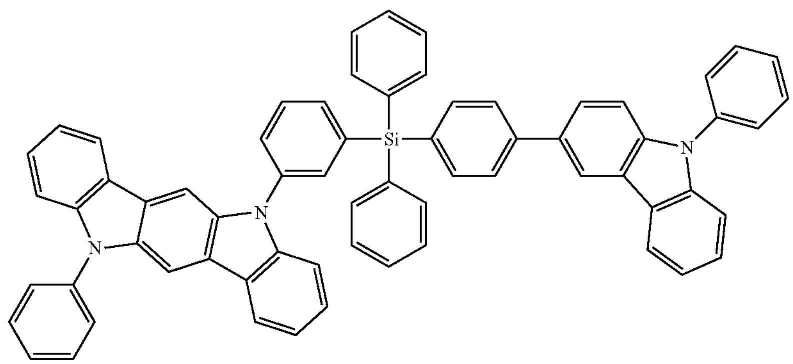
324
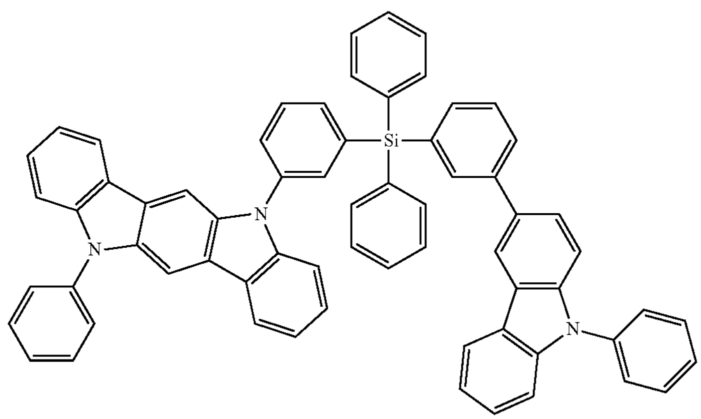

-continued
325
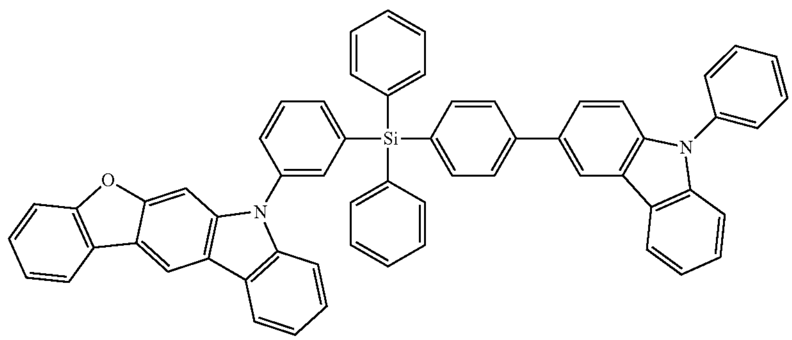
326
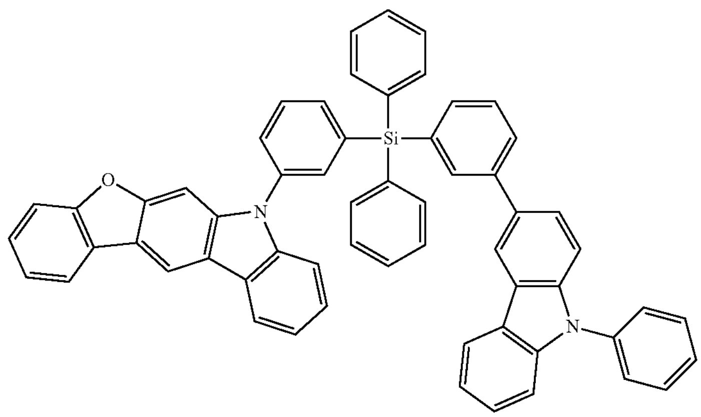
327
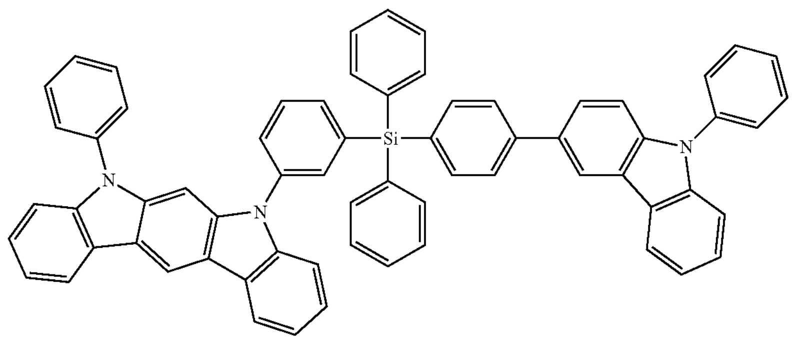
328
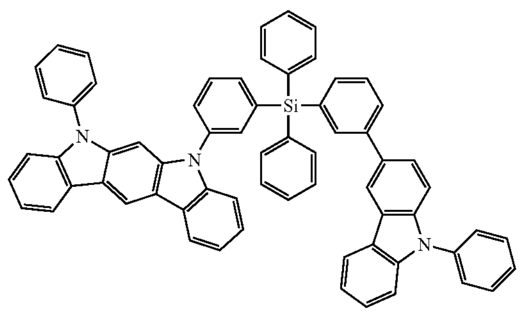
329
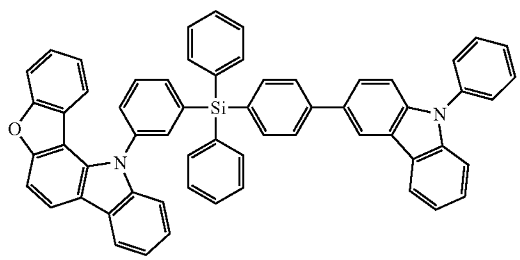

-continued
330
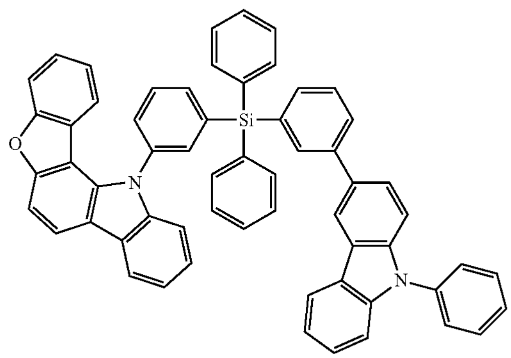
331
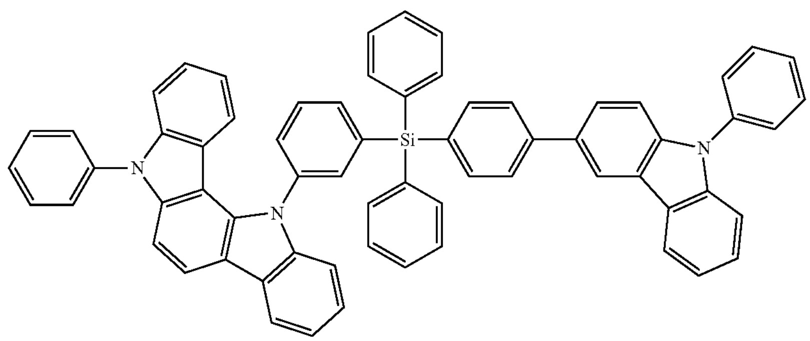
332
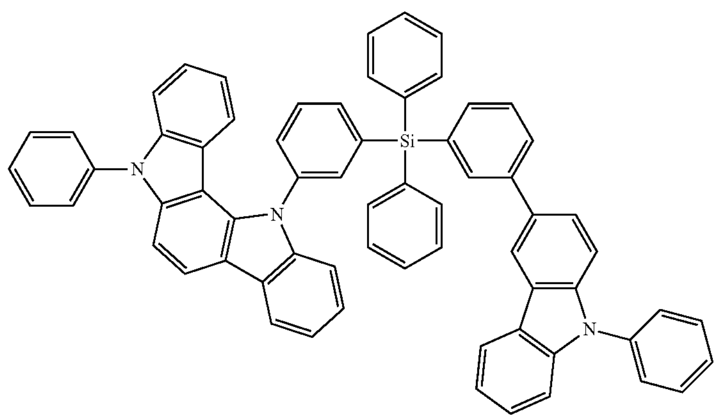
333
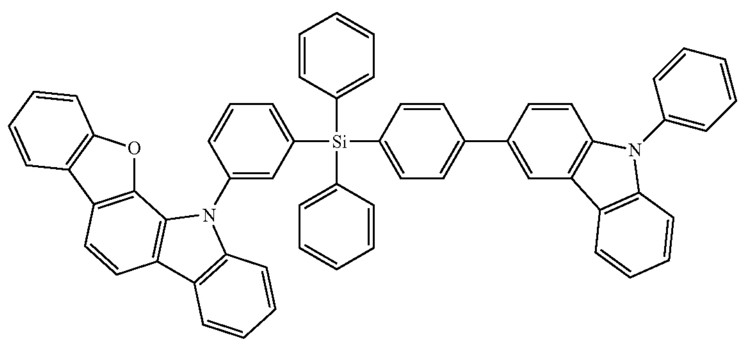

-continued
334
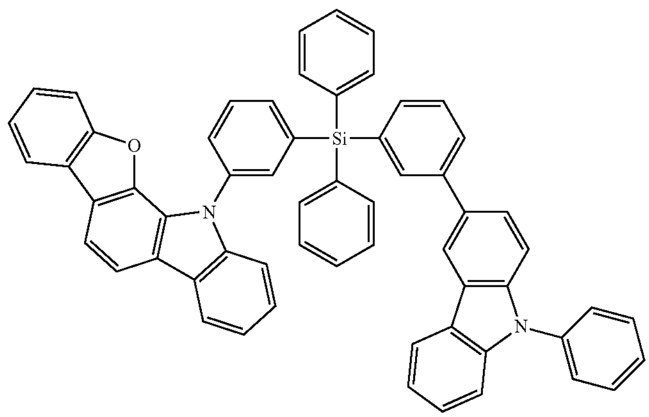
335
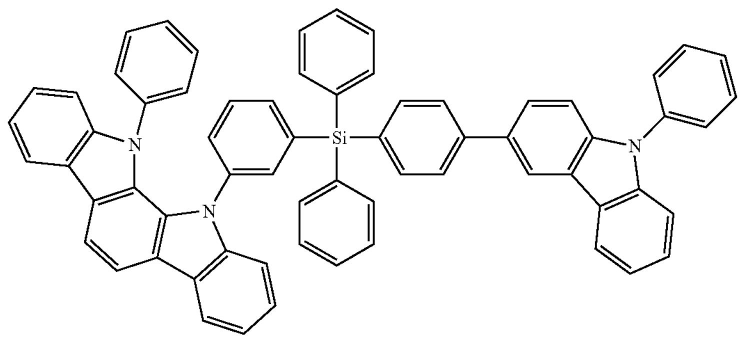
336
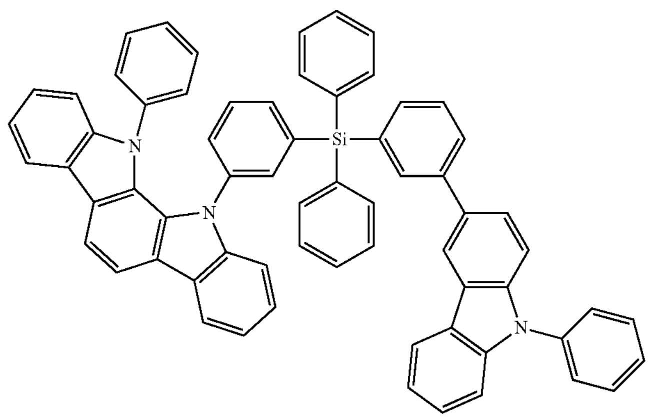
337
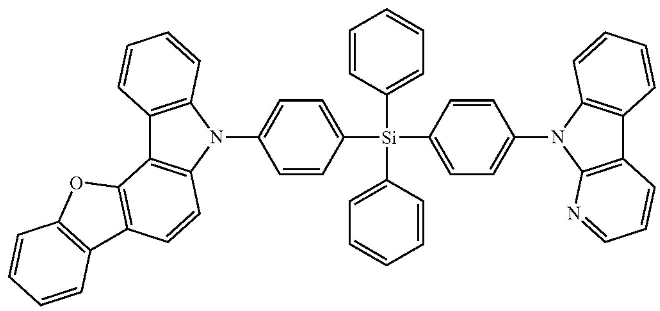

-continued
338
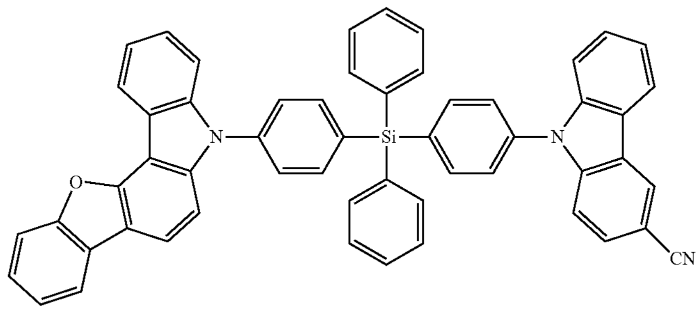
339
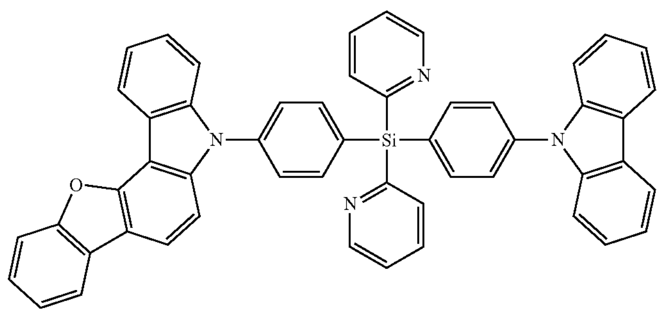
340
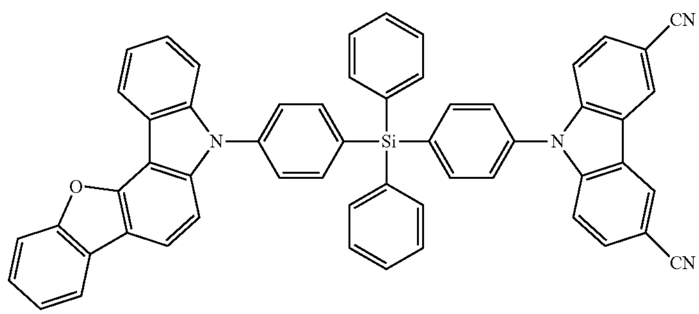
341
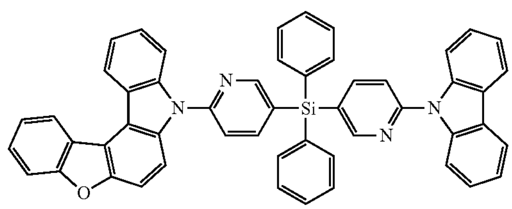
342
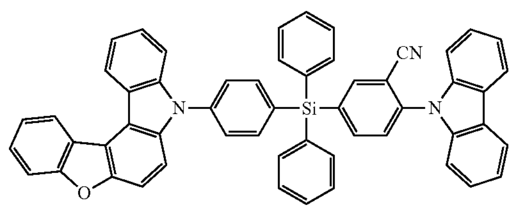
343
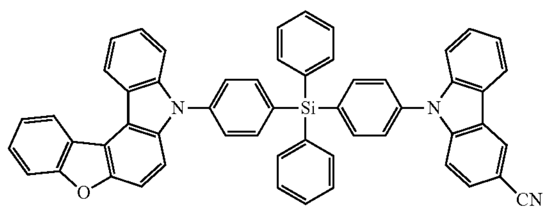
344
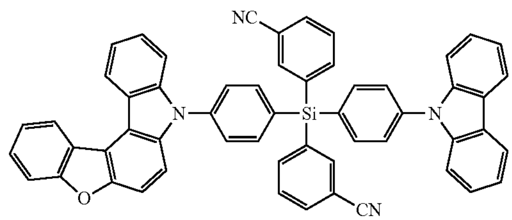

-continued
345
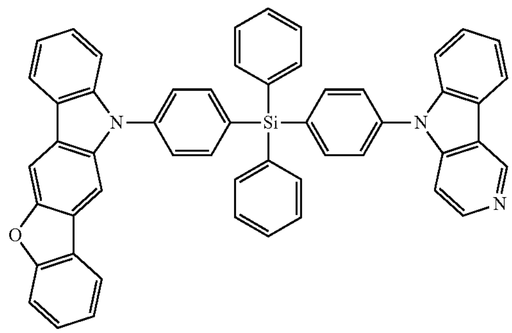
346
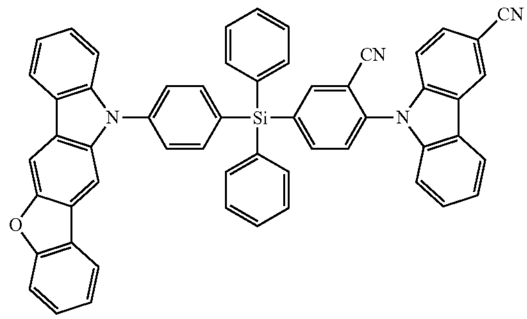
347
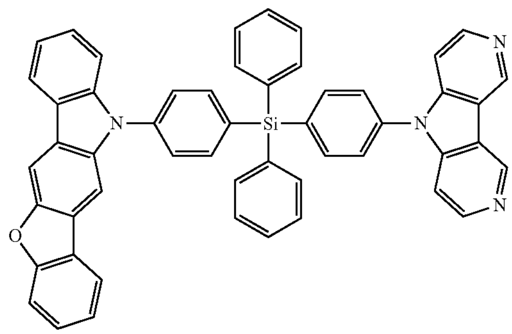
348
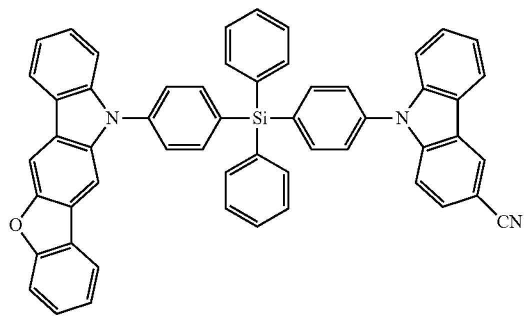
349
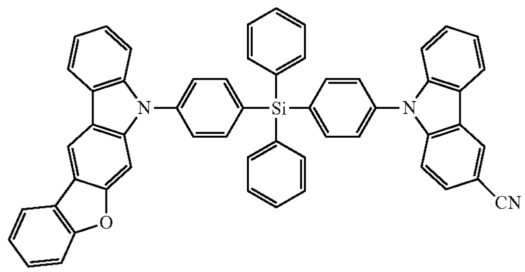
350
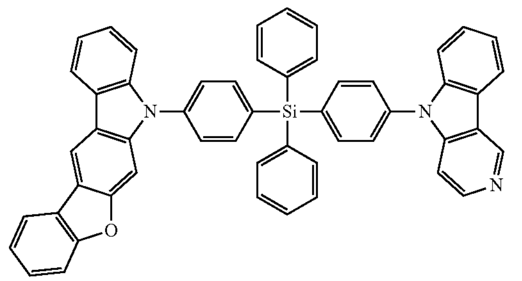
351
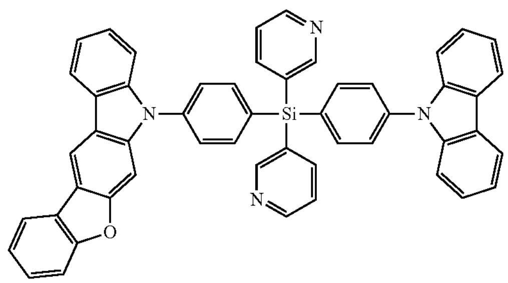
352
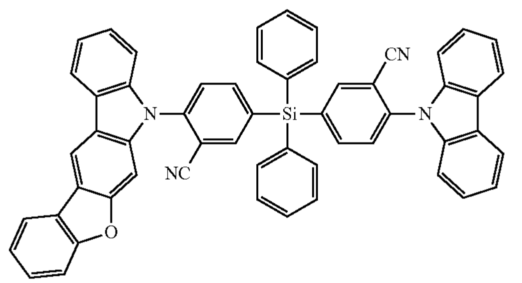
353
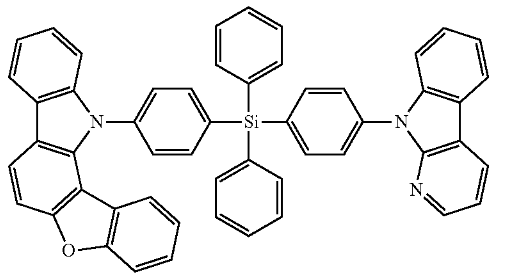
354
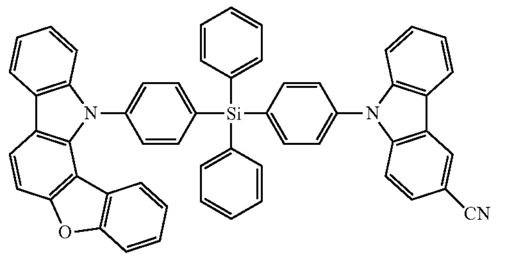

-continued
355
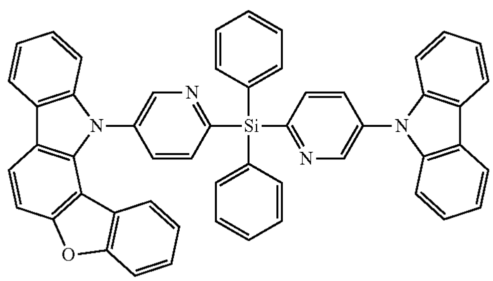
356
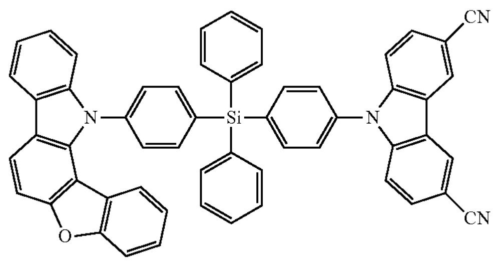
357
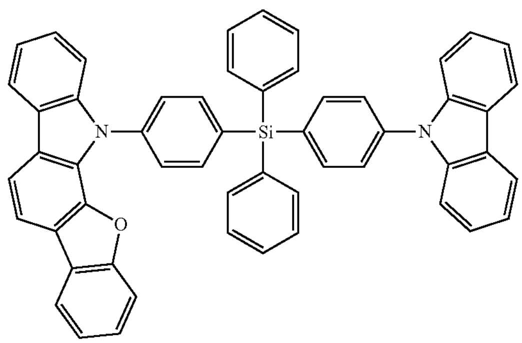
358
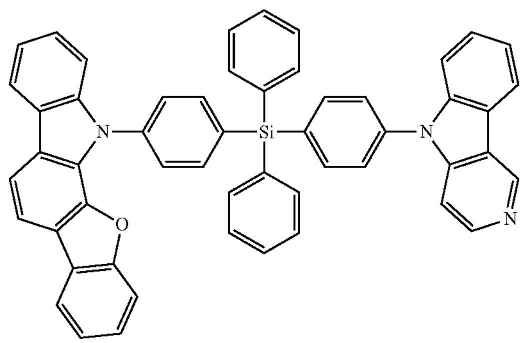
359
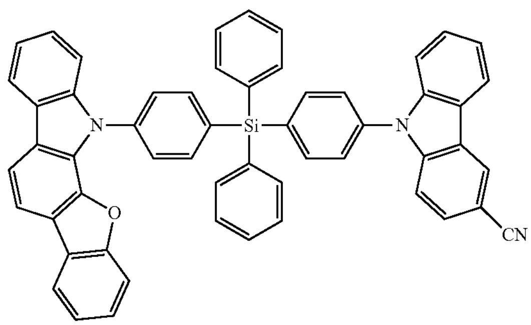
360
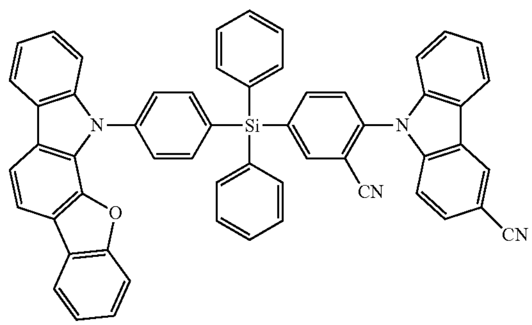
361
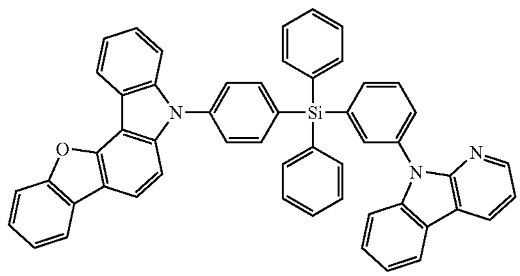
362
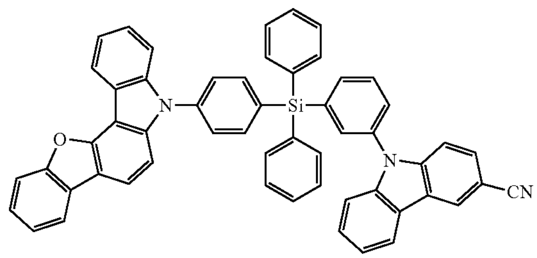
363
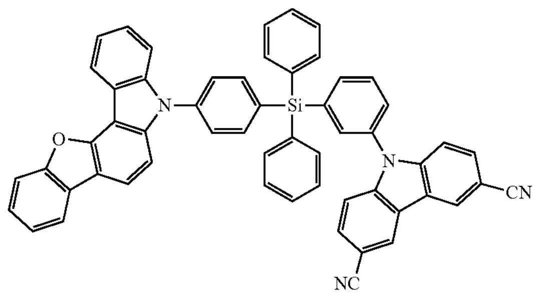
364
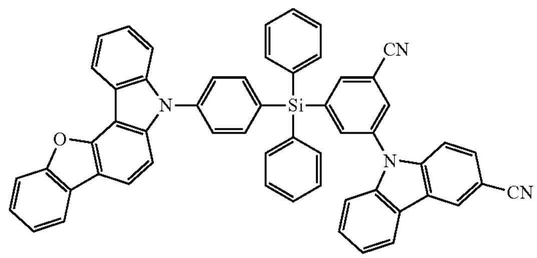

-continued
365
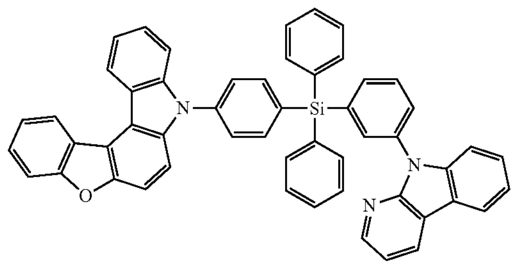
366
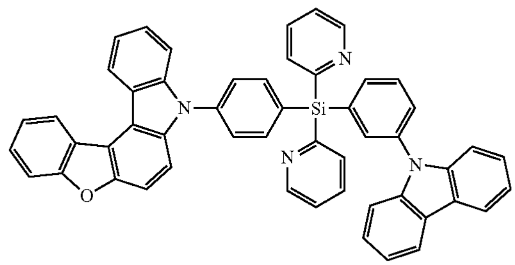
367
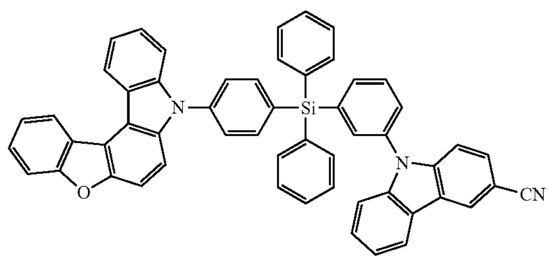
368
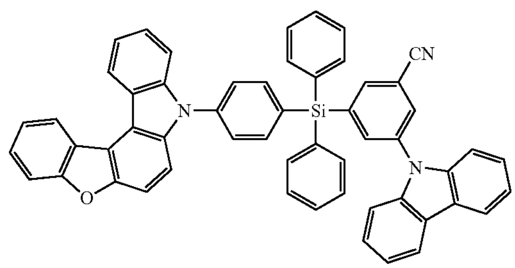
369
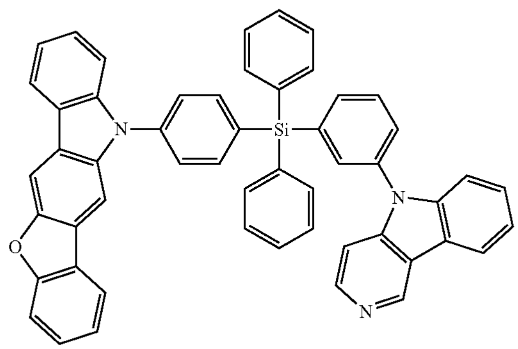
370
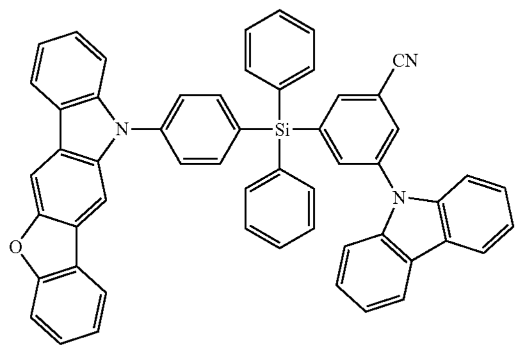
371
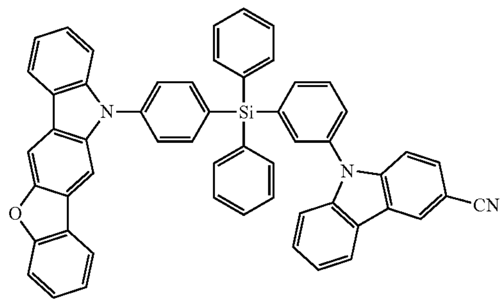
372
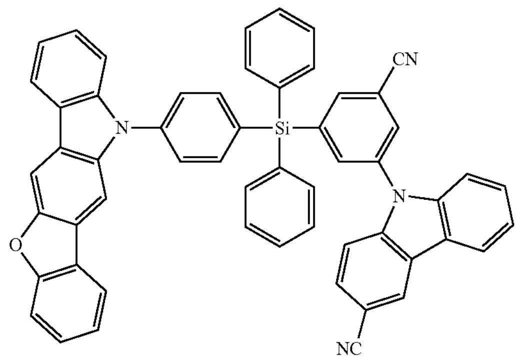
373
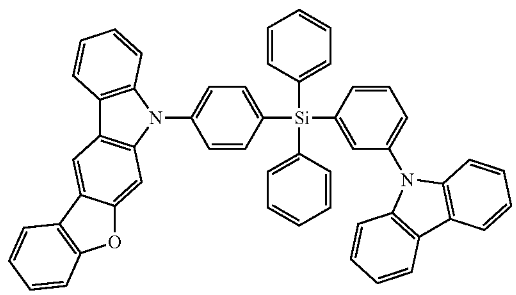
374
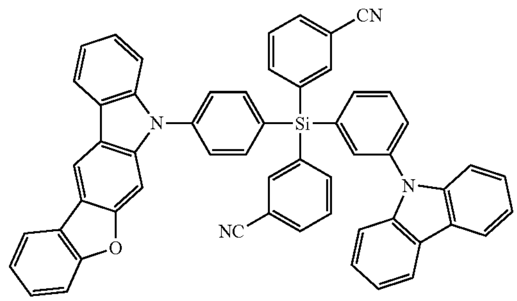

-continued
375
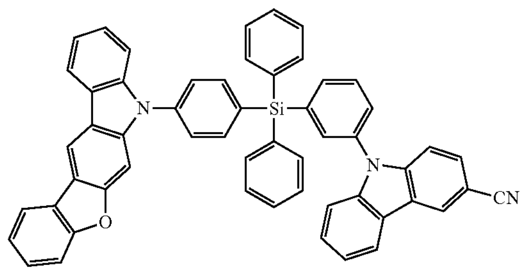
376
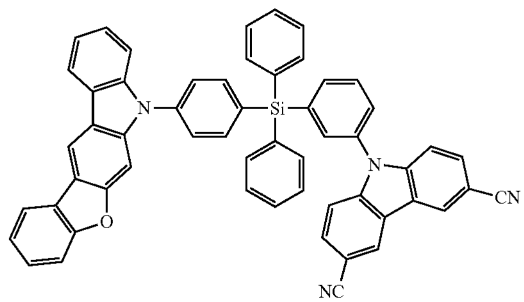
377
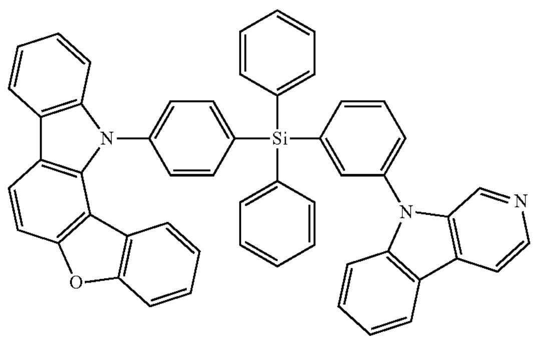
378
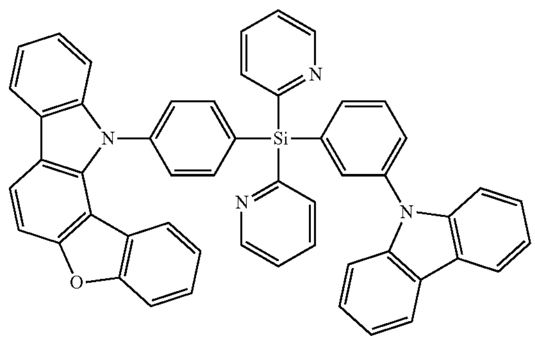
379
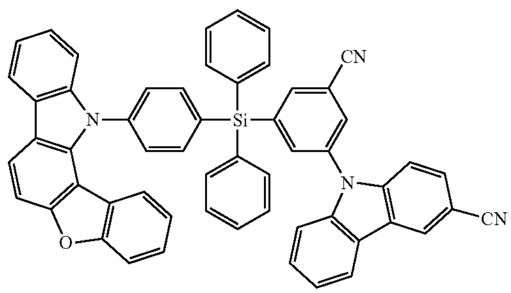
380
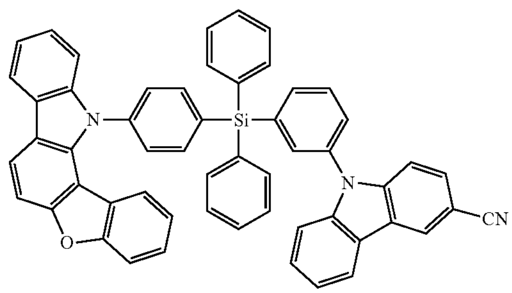
381
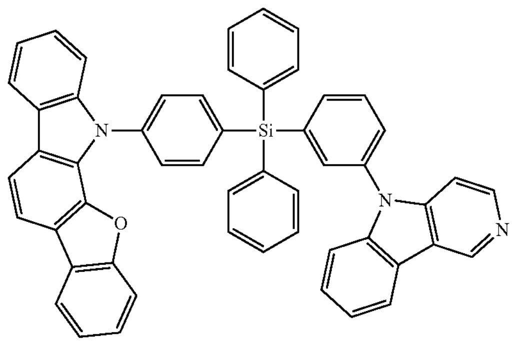
382
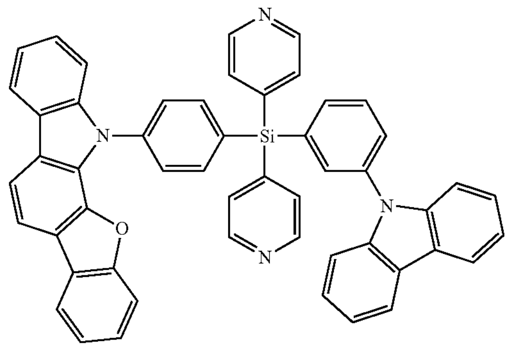
383
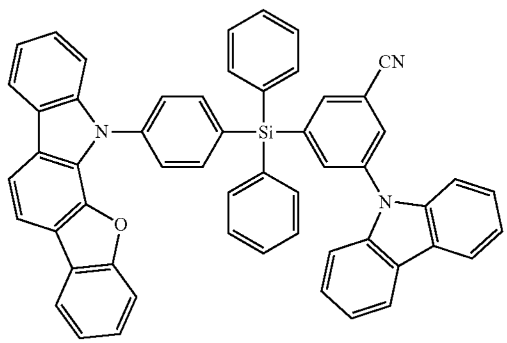
384
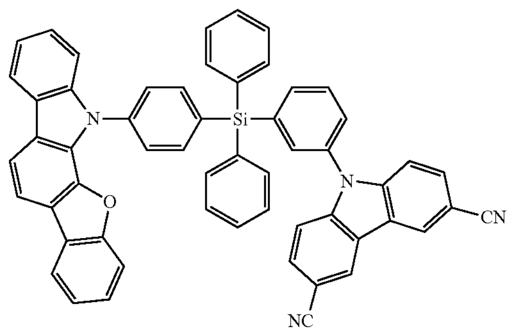

-continued
385
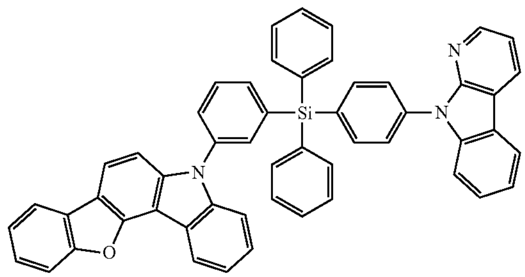
386
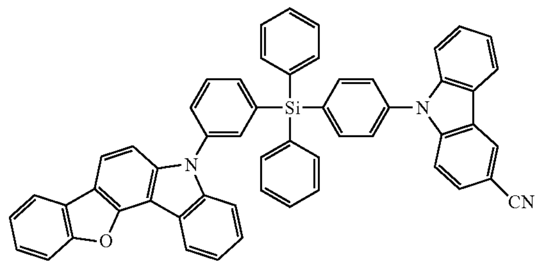
387
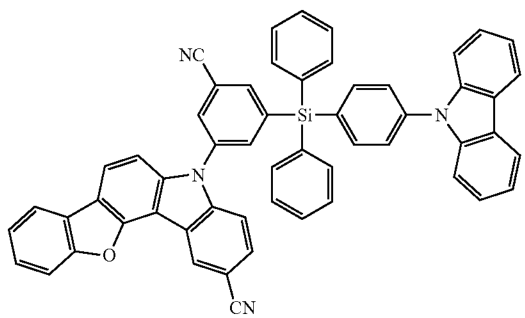
388
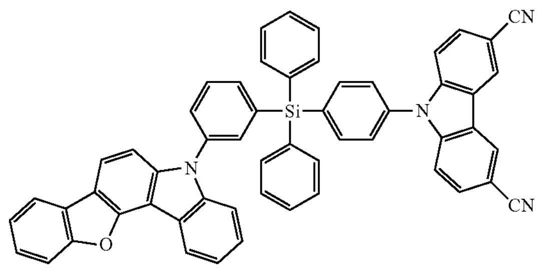
389
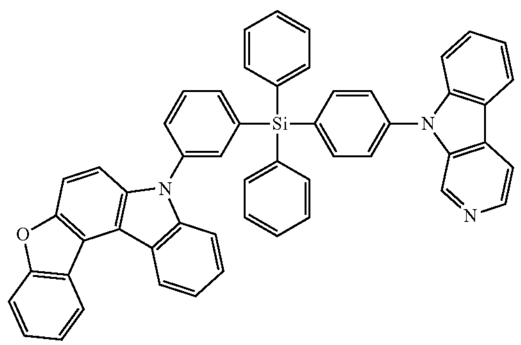
390
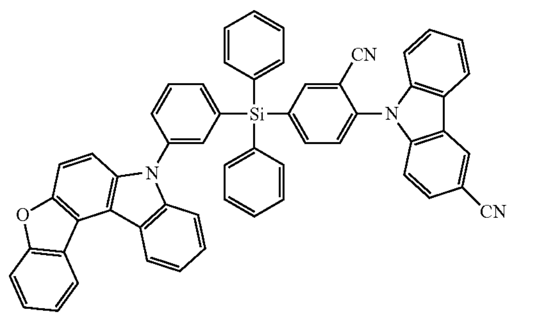
391
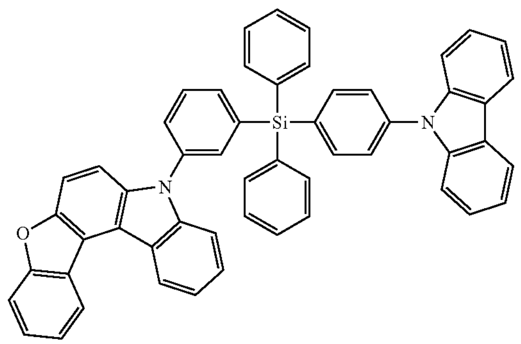
392
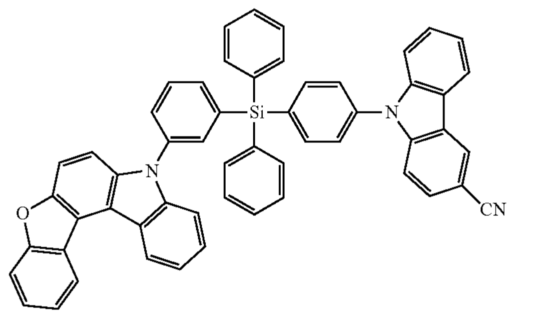
393
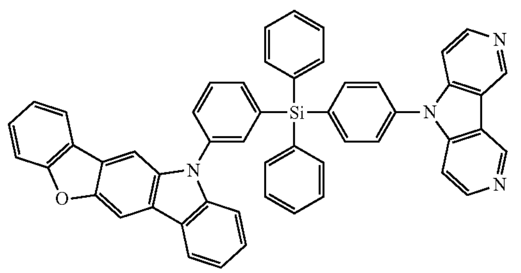
394
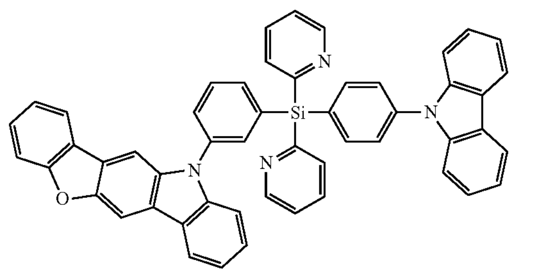

-continued
395
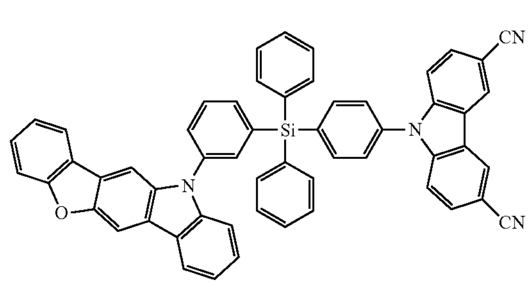
396
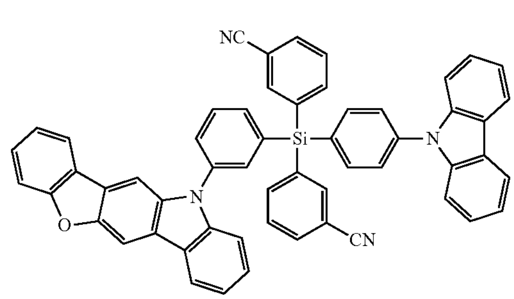
397
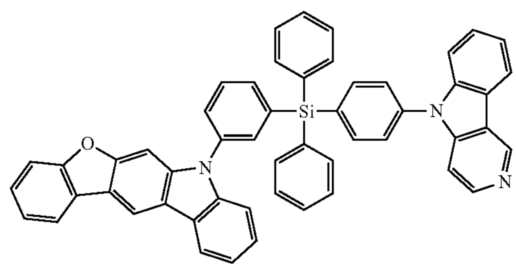
398
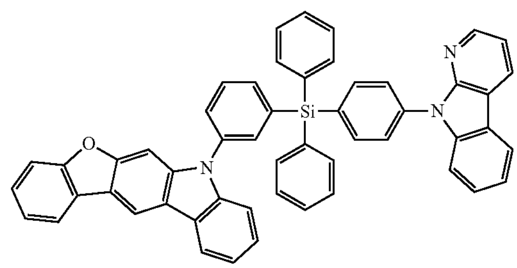
399
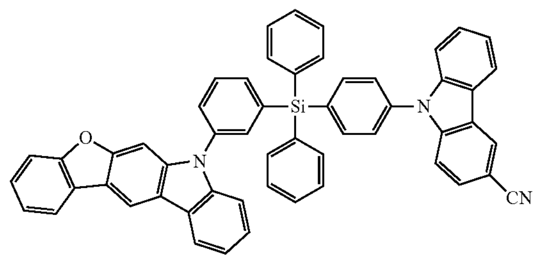
400
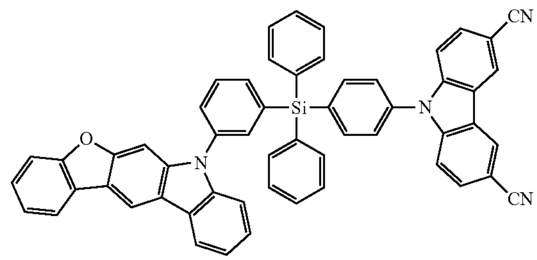
401
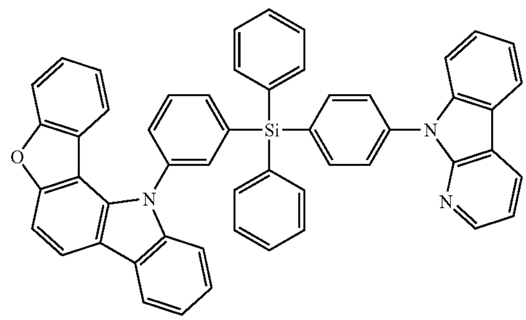
402
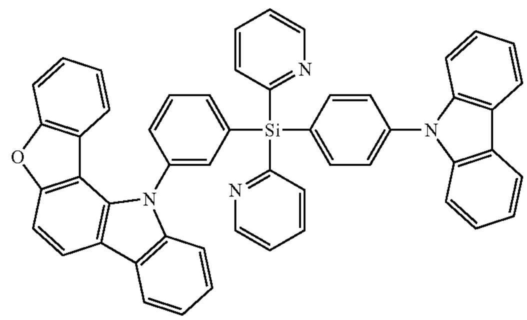
403
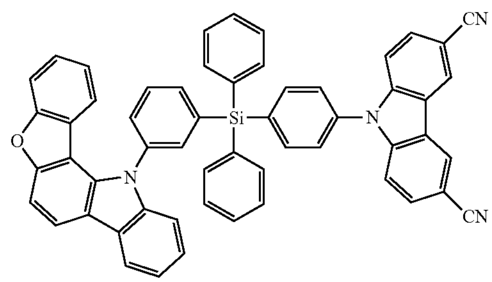
404
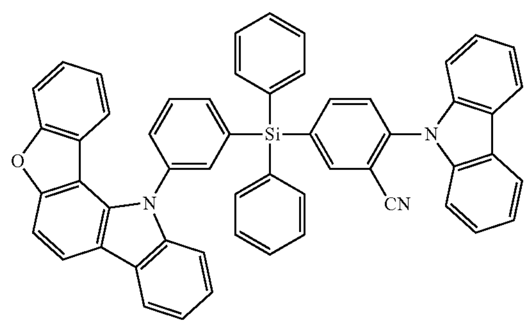

-continued
405
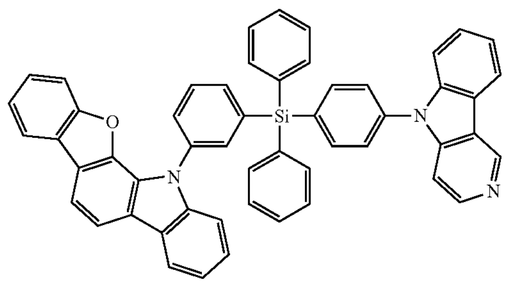
406
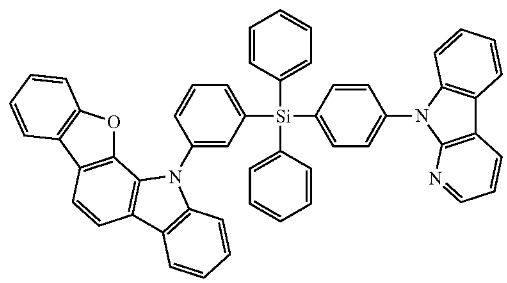
407
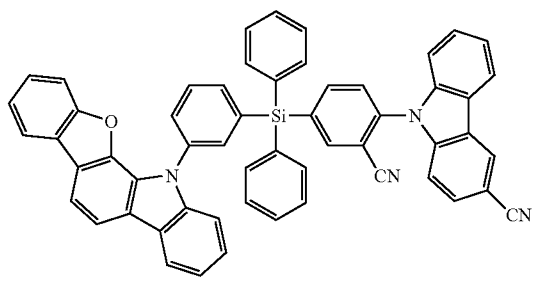
408
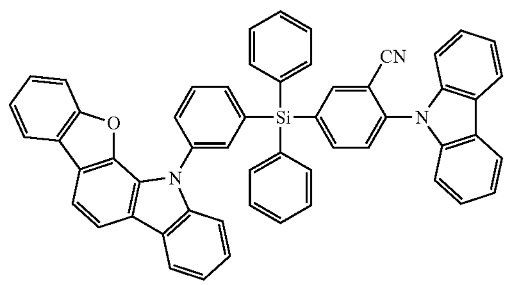
409
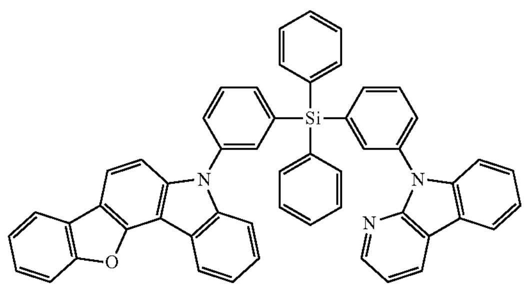
410
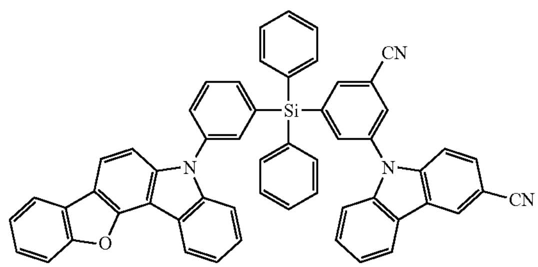
411
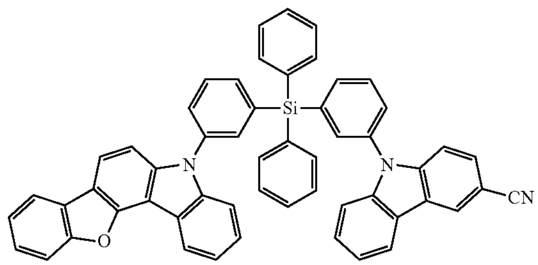
412
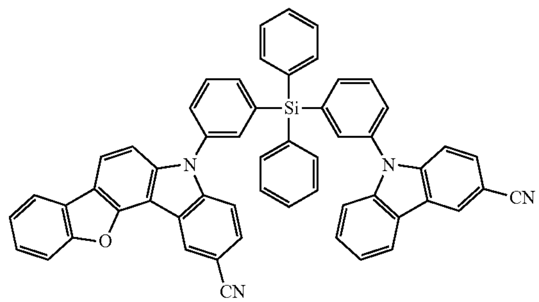
413
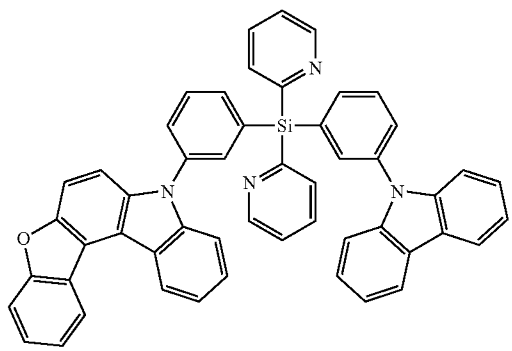
414
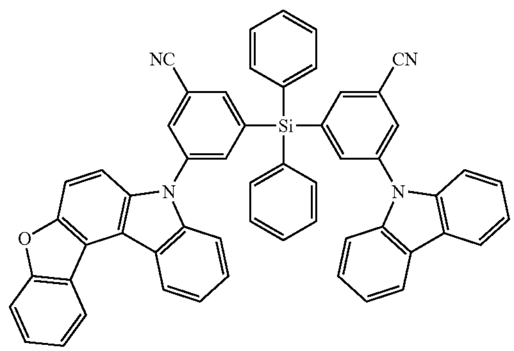

-continued
415
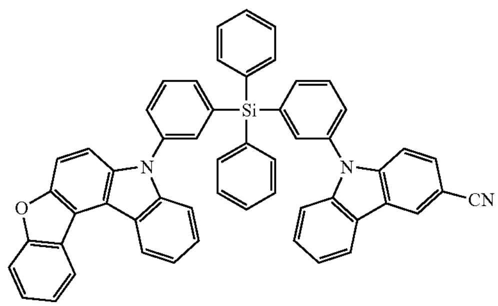
416
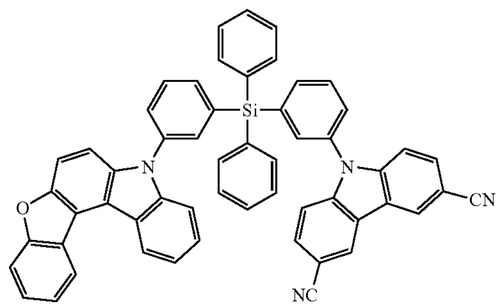
417
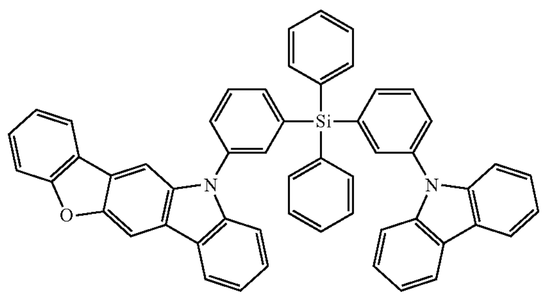
418
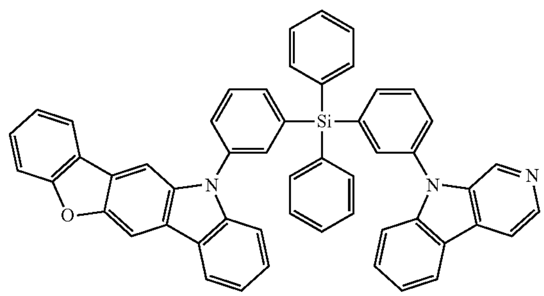
419
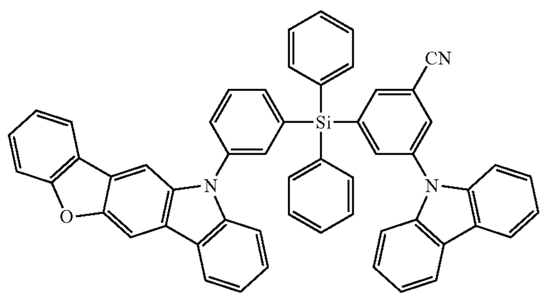
420
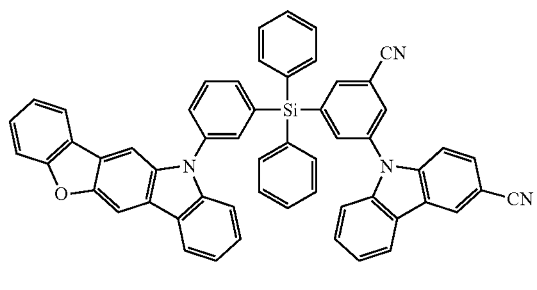
421
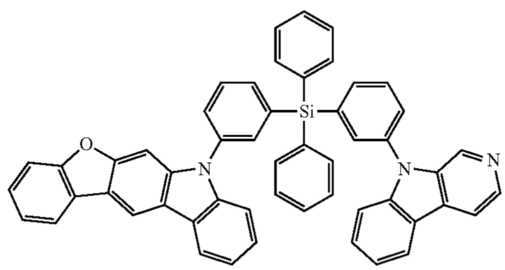
422
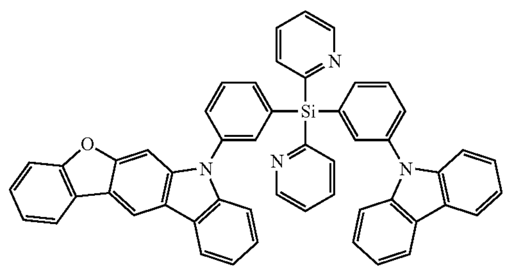
423
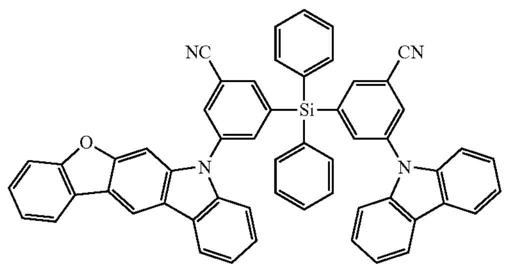
424
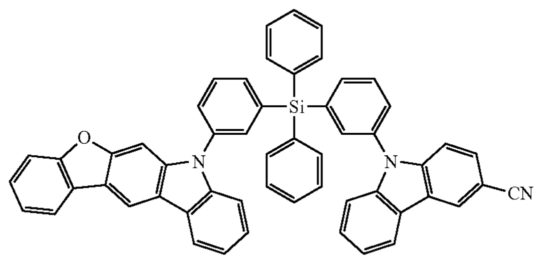

-continued
425
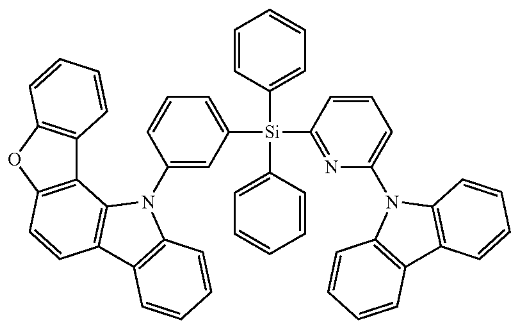
426
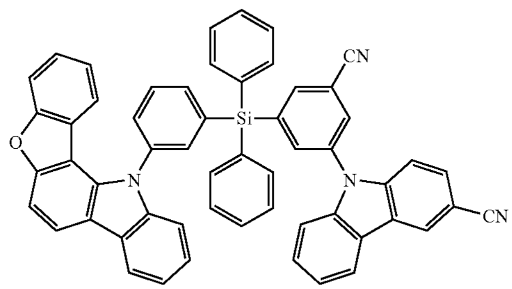
427
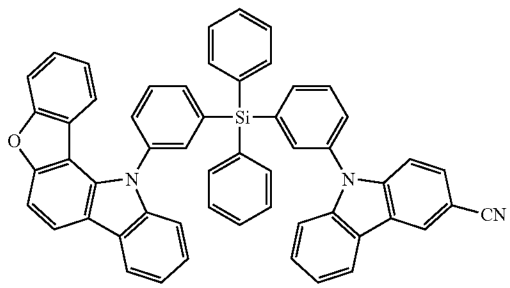
428
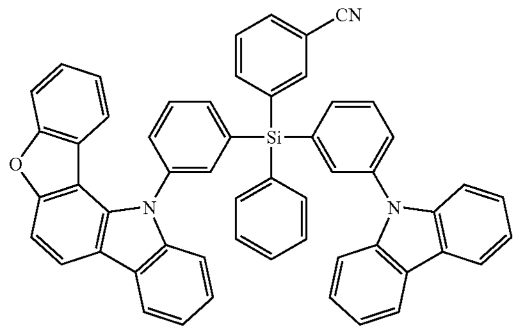
429
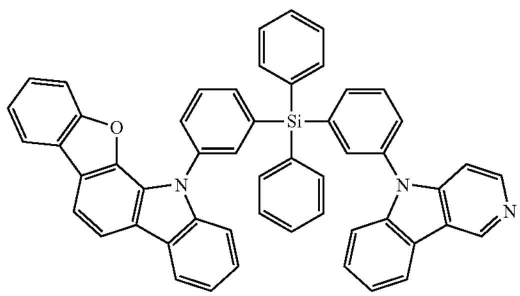
430
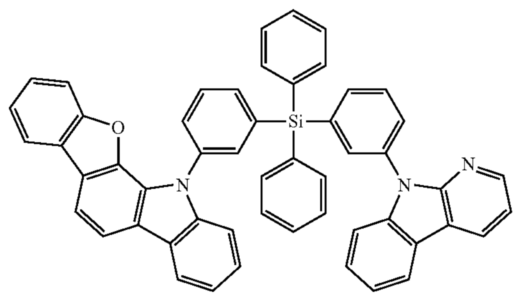
431
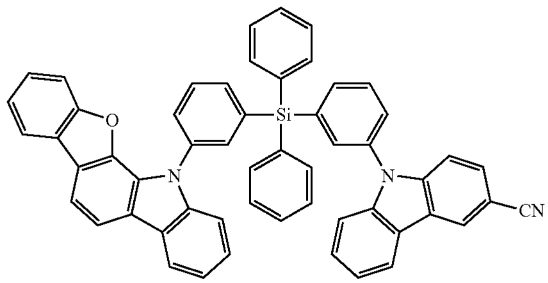
432
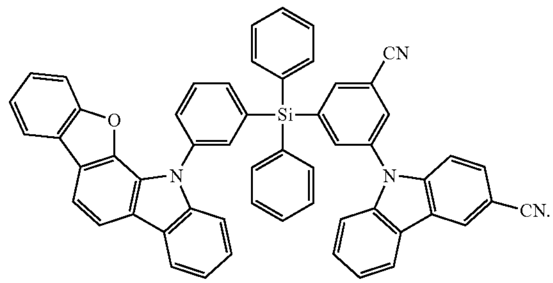

In Compounds 1 to 432,

Ph represents a phenyl group.

In one or more embodiments, the hole-transporting host may include o-CBP or mCP:

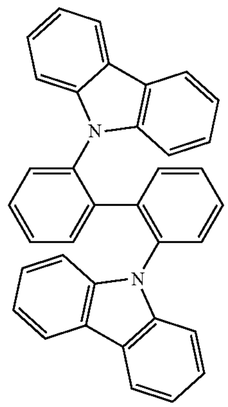

o-CBP

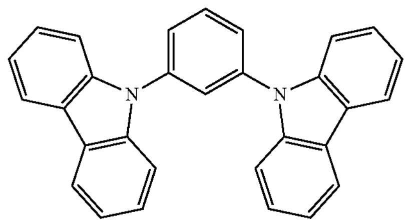

mCP

In an embodiment, the host may be a fluorescent host, and such a fluorescent host may be, for example, represented by one of Formulae FH-1 to FH-4.

In an embodiment, the fluorescent host may be represented by Formula FH-1:

Formula FH-1

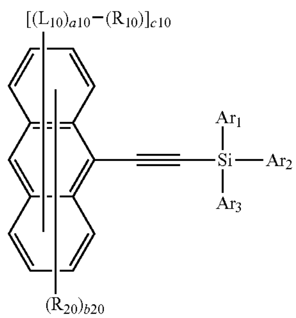

In Formula FH-1, $Ar_1$ to $Ar_3$ may each independently be a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)(Q), $Ar_1$ to $Ar_3$ may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, $L_{10}$ may be an unsubstituted or substituted $C_5$-$C_{30}$ carbocyclic group or an unsubstituted or substituted $C_1$-$C_{30}$ heterocyclic group, a10 may be an integer from 0 to 3, wherein, when a10 is 2 or more, two or more of $L_{10}$ may be identical to or different from each other, $R_{10}$ and $R_{20}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)(Q), b10 and b20 may each independently be an integer from 1 to 8, when b10 is 2 or more, two or more of $R_{10}$ may be identical to or different from each other, and when b20 is 2 or more, two or more of $R_{20}$ may be identical to or different from each other, c10 may be an integer from 1 to 9, and when c10 is 2 or more two or more of -[$(L_{10})_{a10}$-$(R_{10})_{b10}$] may be identical to or different from each other.

In detail, the fluorescent host represented by Formula FH-1 may be compounds of Group FH1, embodiments of the present disclosure are not limited thereto:

Group FH1
1
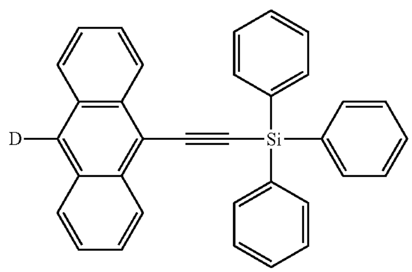
2
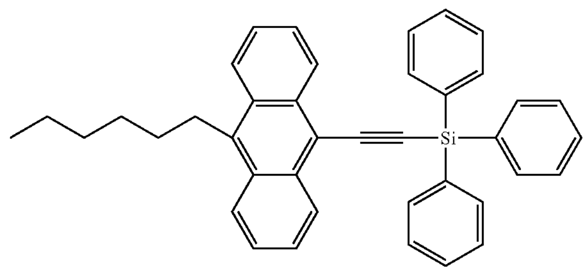
3
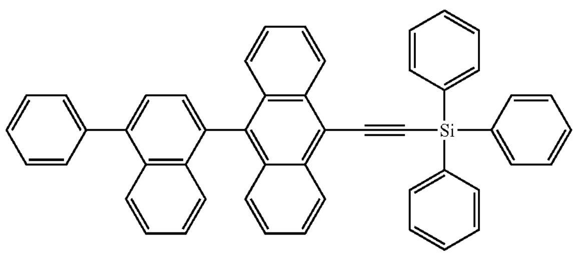
4
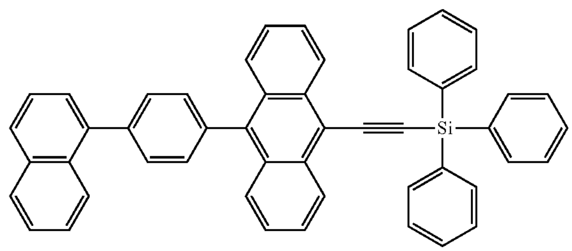
5
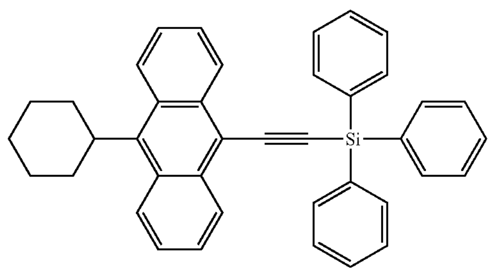
-continued
6
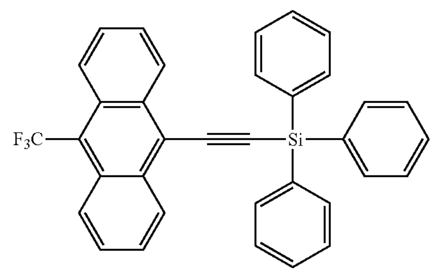
7
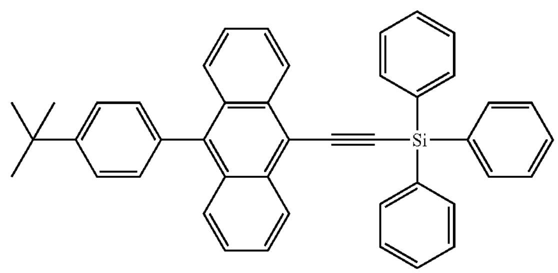
8
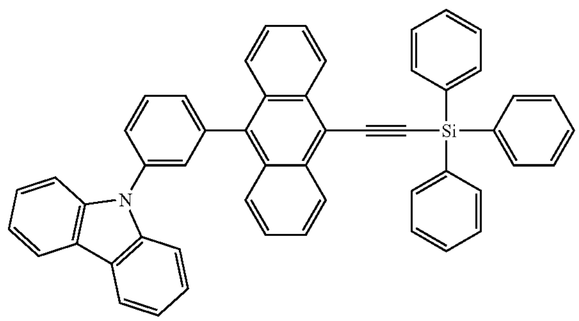
9
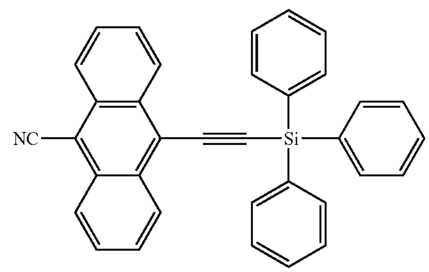
10
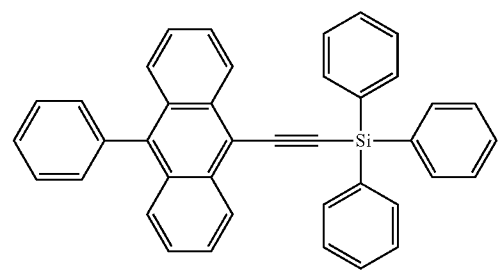

-continued
11
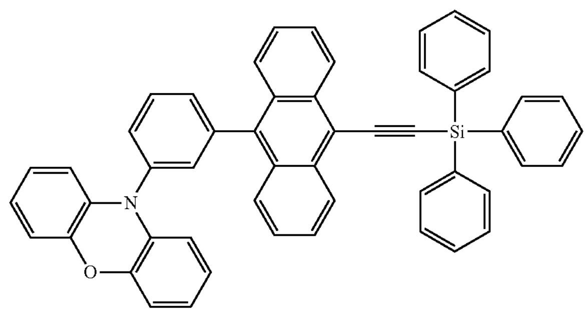
12
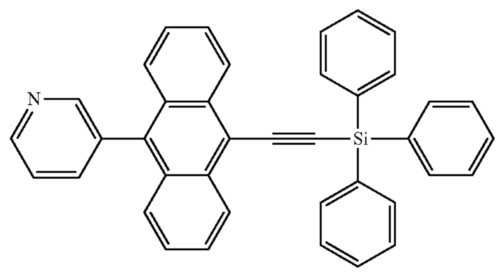
13
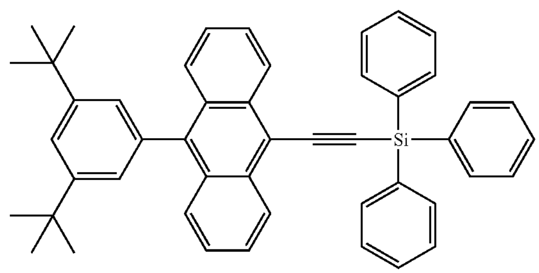
14
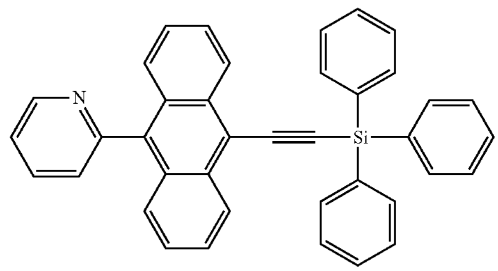
15
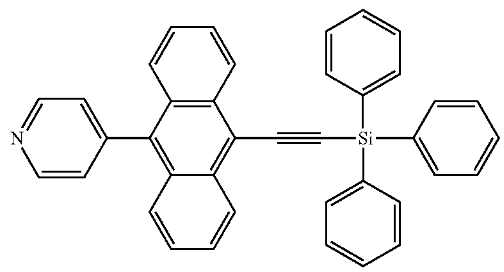
-continued
16
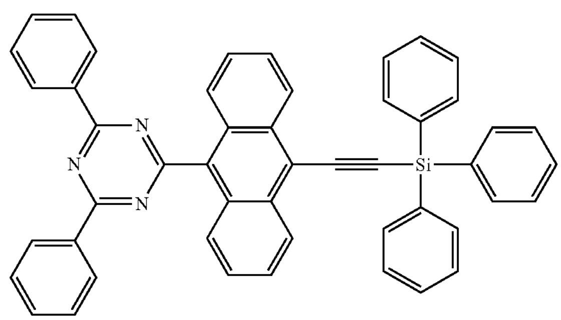
17
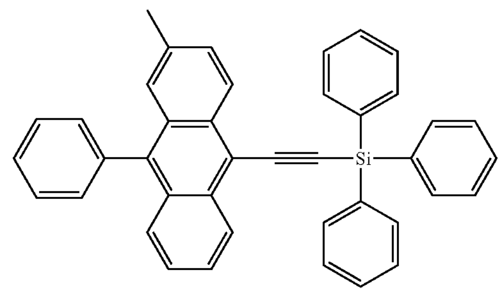
18
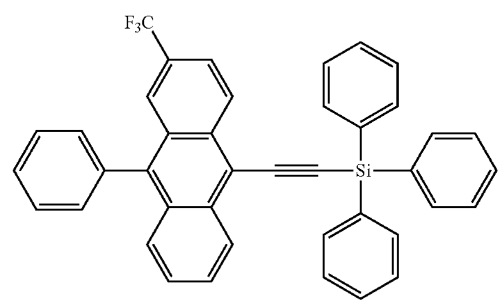
19
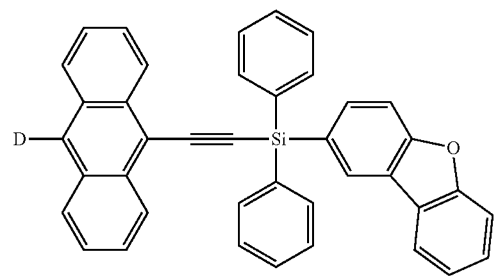
20
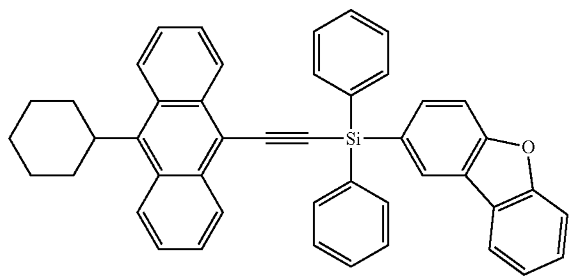

21
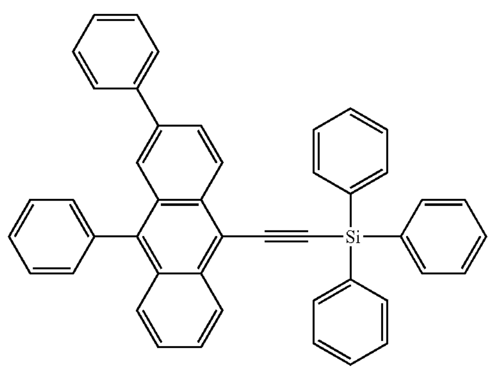
22
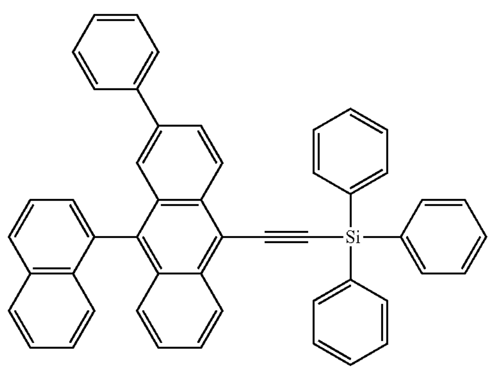
23
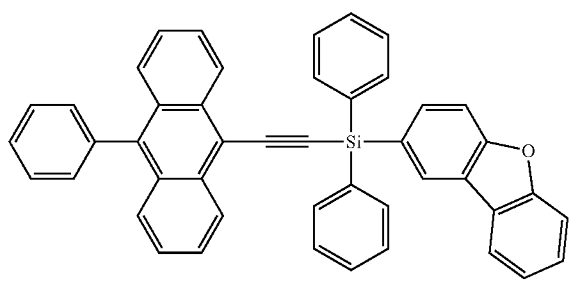
24
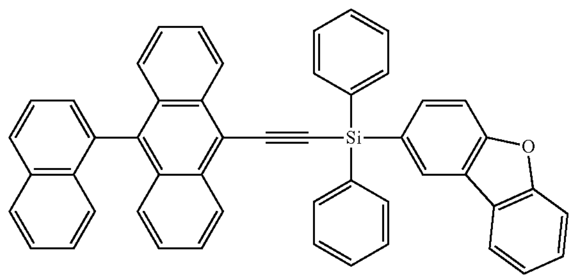
25
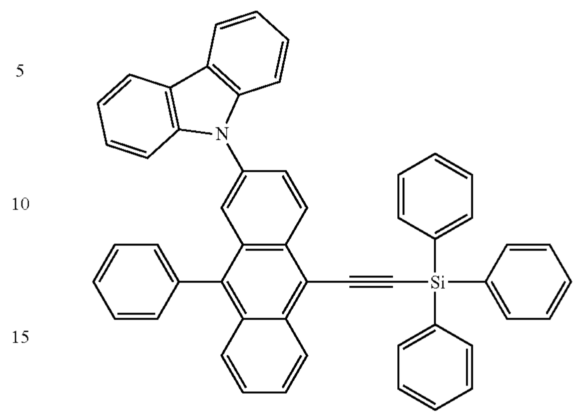
26
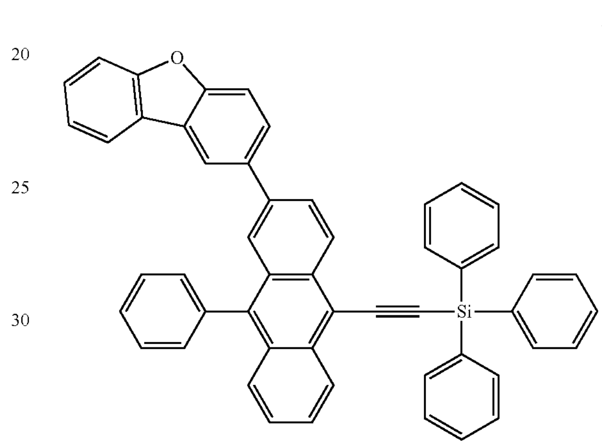
27
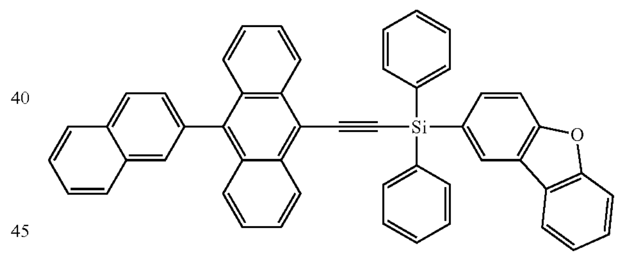
28
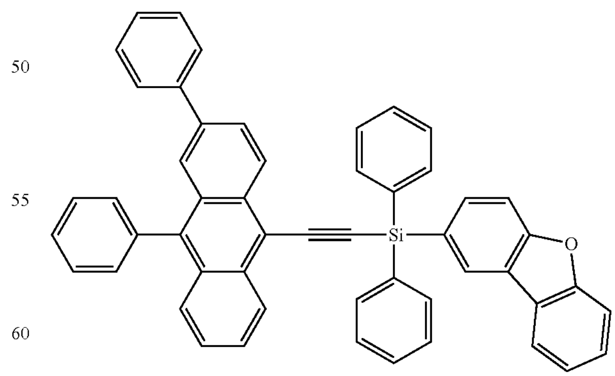

-continued
29
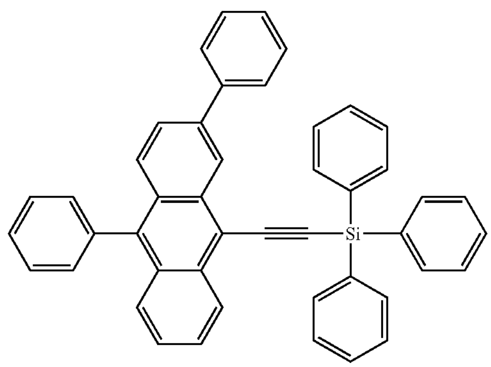
30
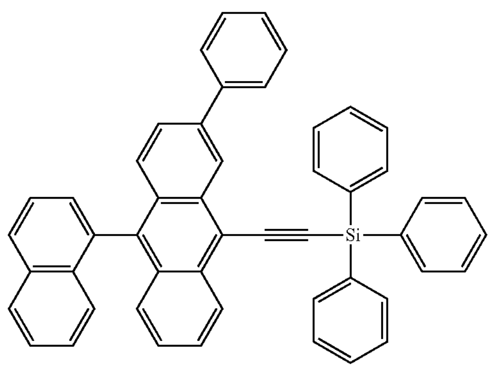
31
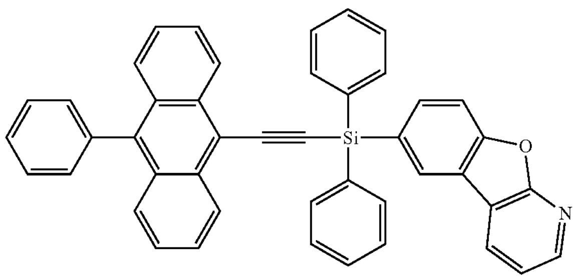
32
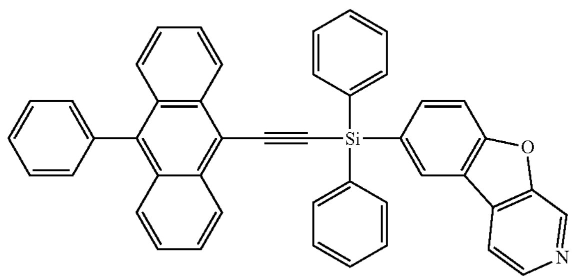
33
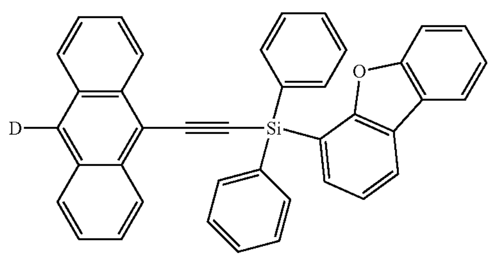
-continued
34
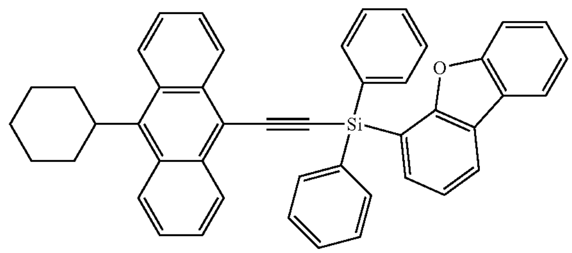
35
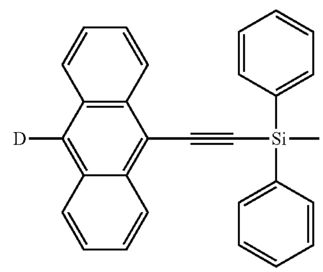
36
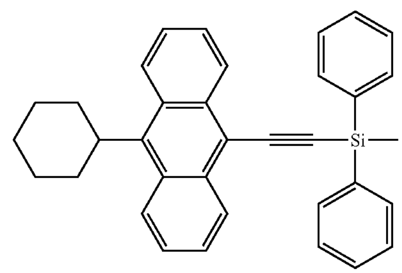
37
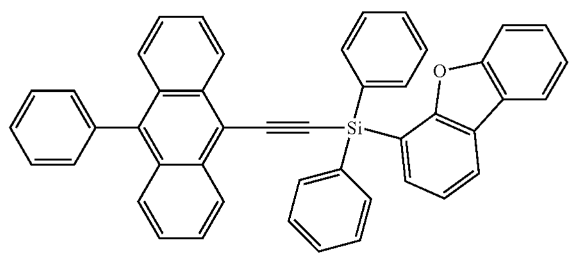
38
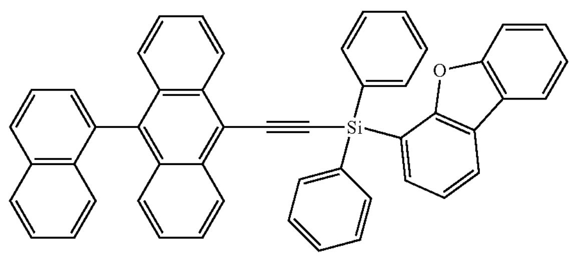

-continued
39
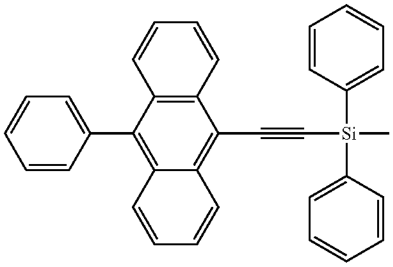
40
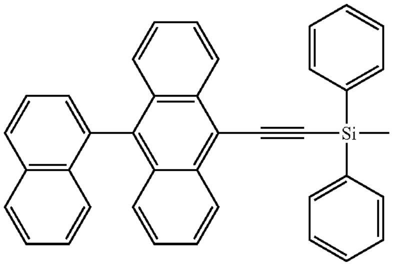
41
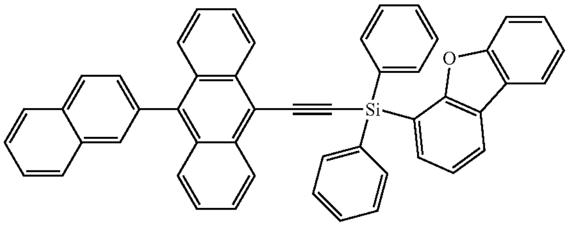
42
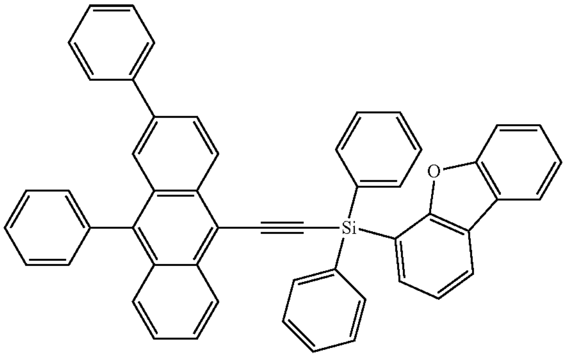
43
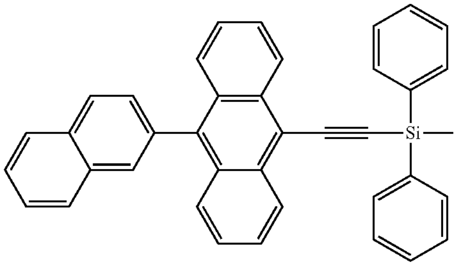
-continued
44
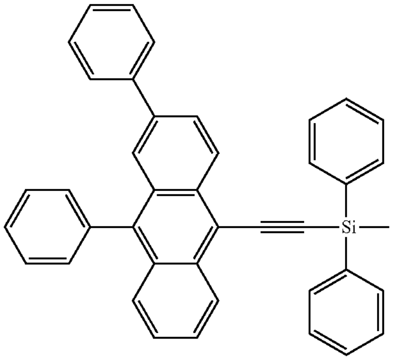
45
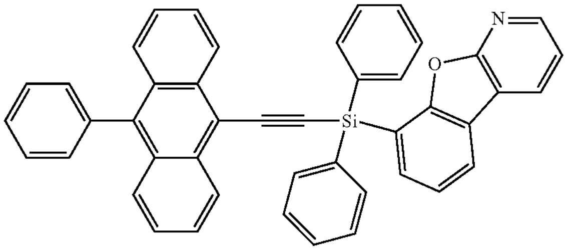
46
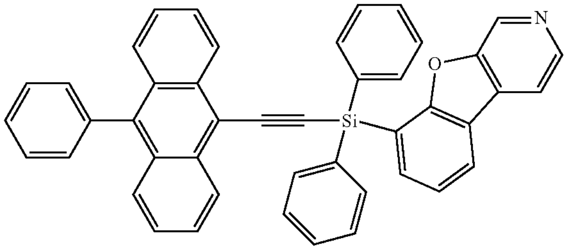
47
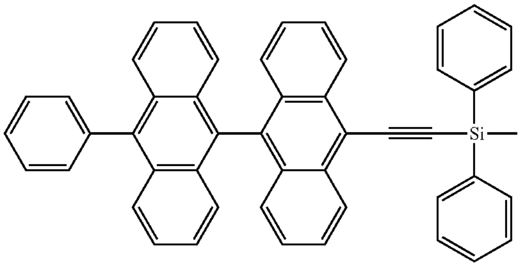
48
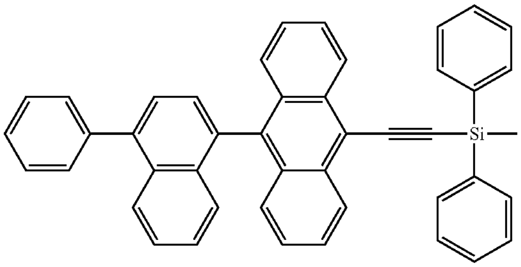

-continued
49
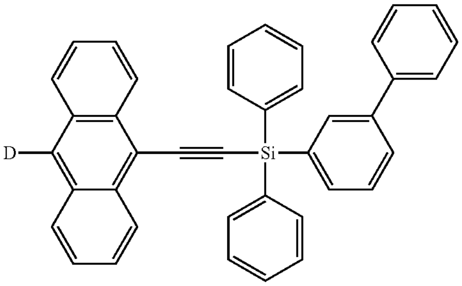
50
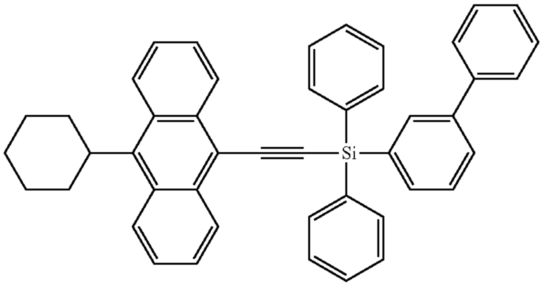
51
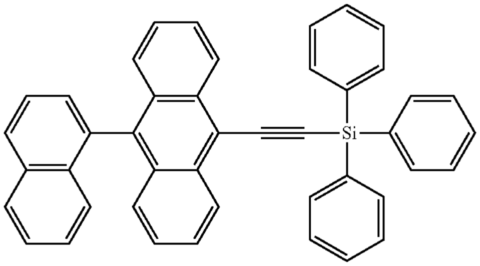
52
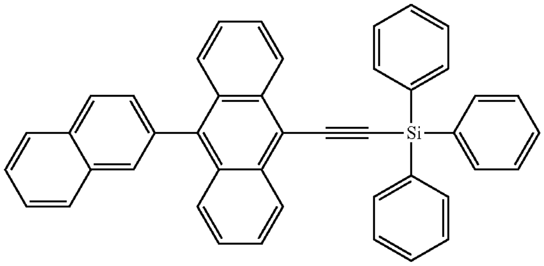
53
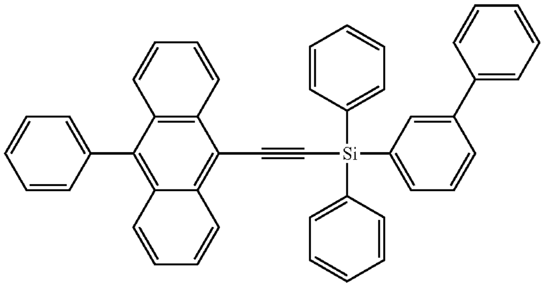
-continued
54
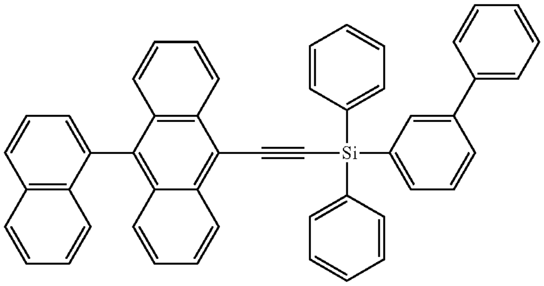
55
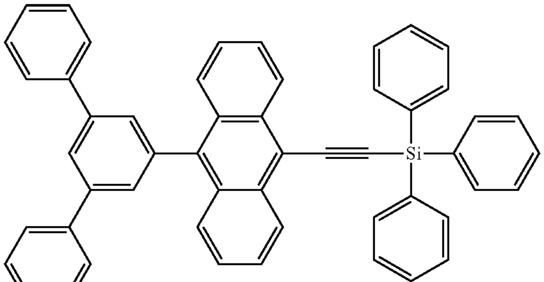
56
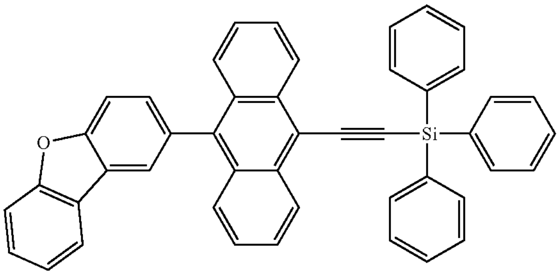
57
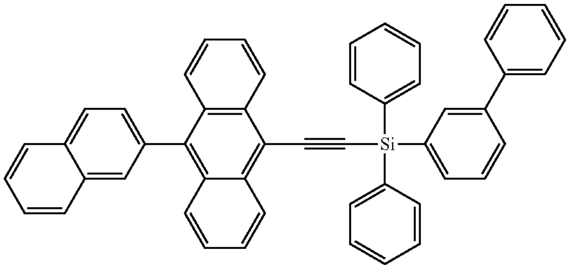
58
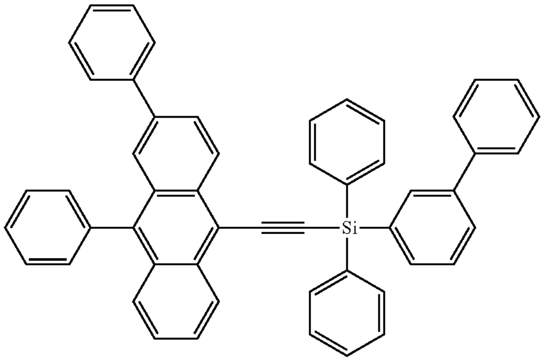

-continued
59
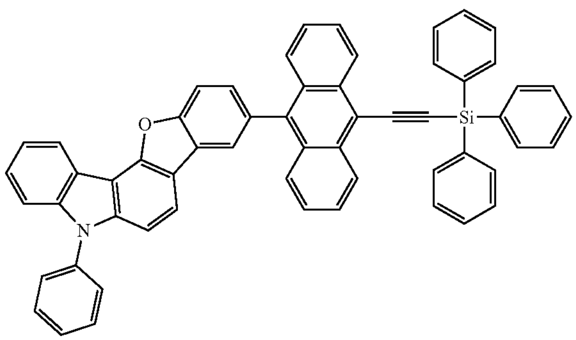
60
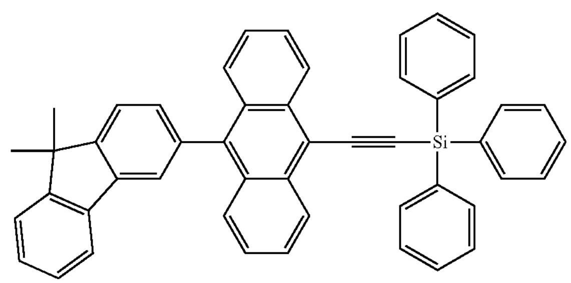
61
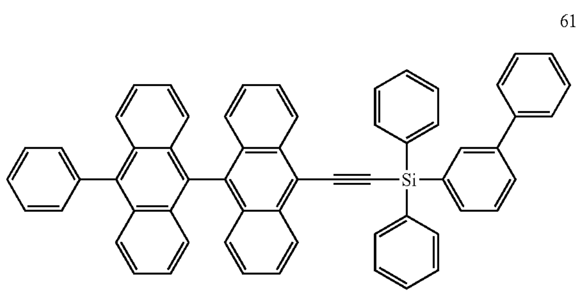
62
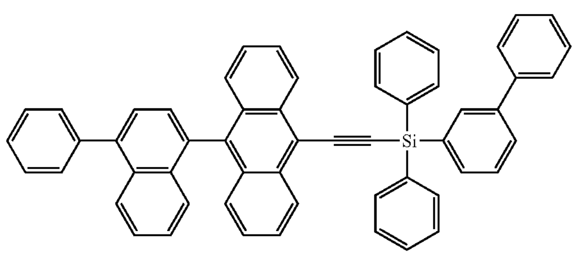
63
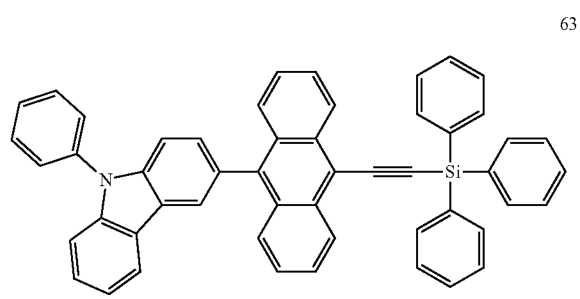
-continued
64
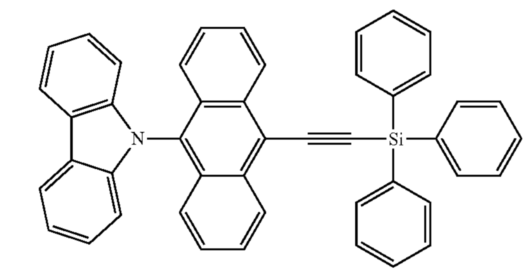
65
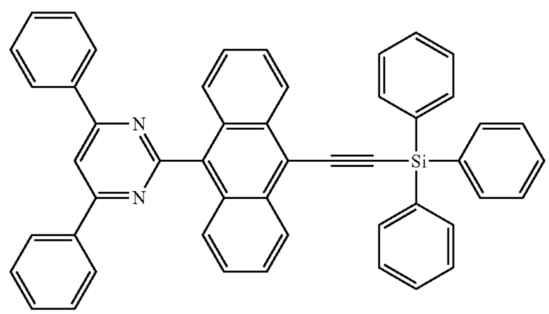
66
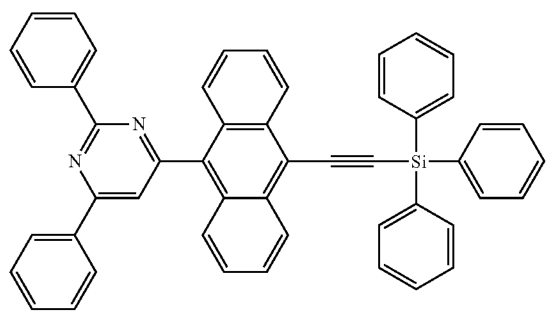
67
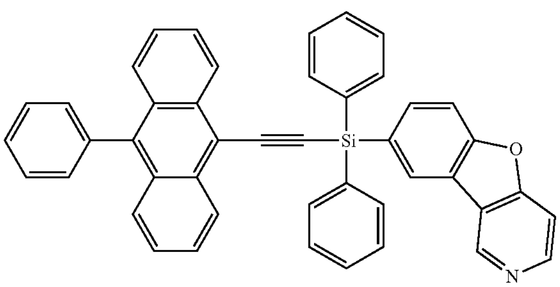
68
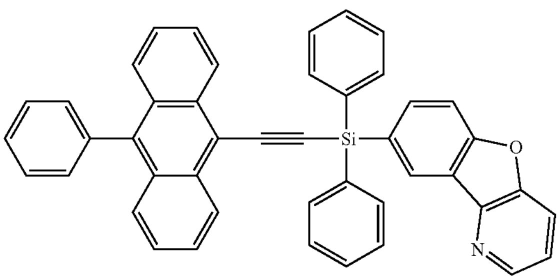

-continued
69
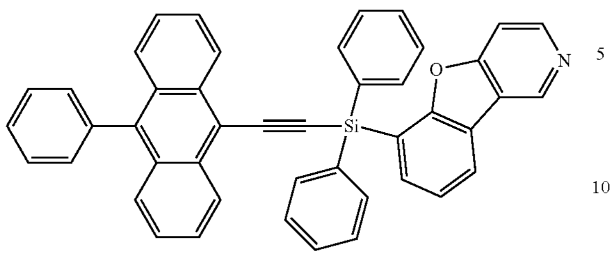
70
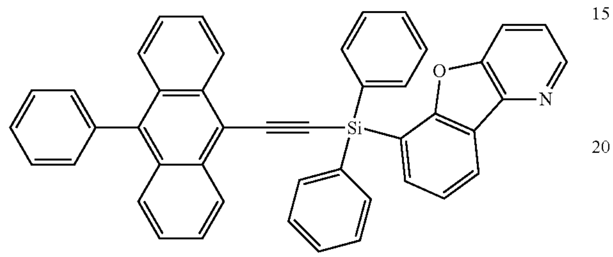
71
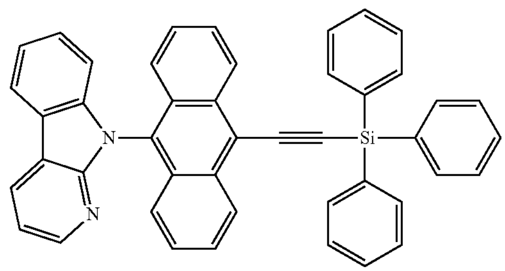
72
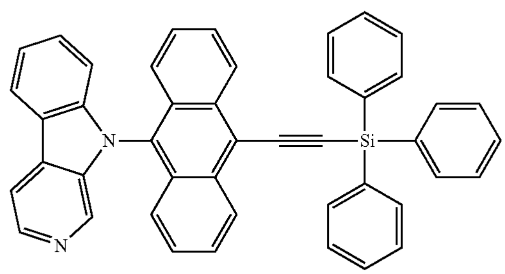
73
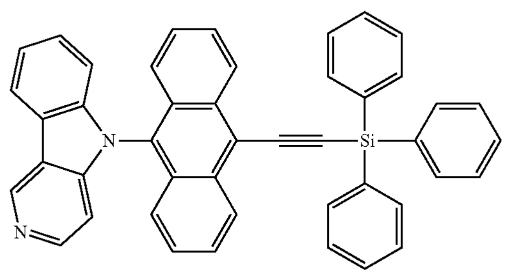
-continued
74
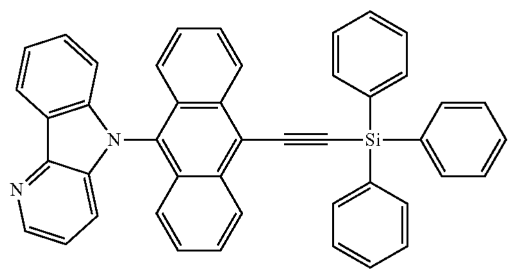
75
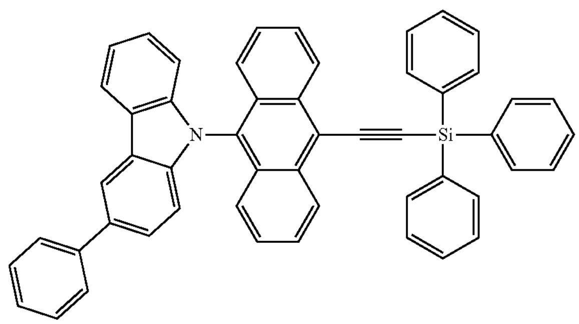
76
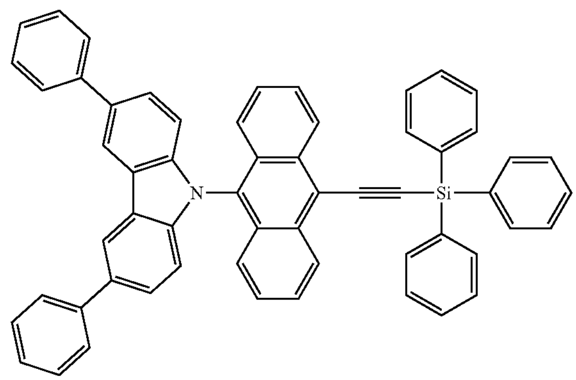
77
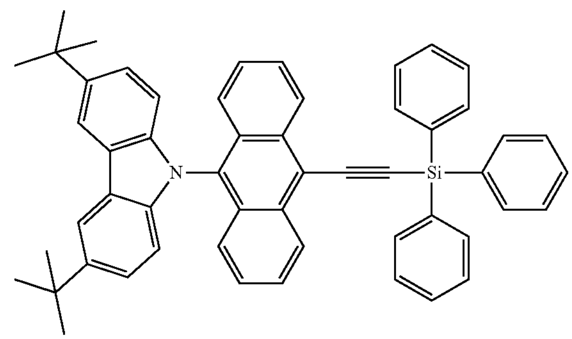

78
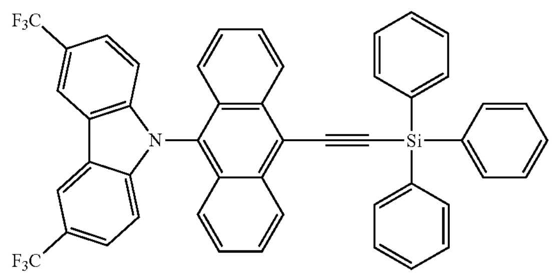
79
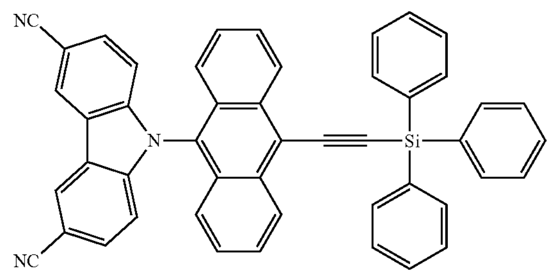
80
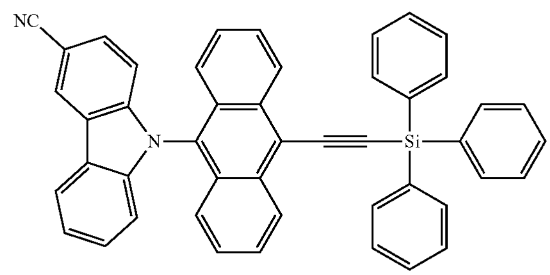
81
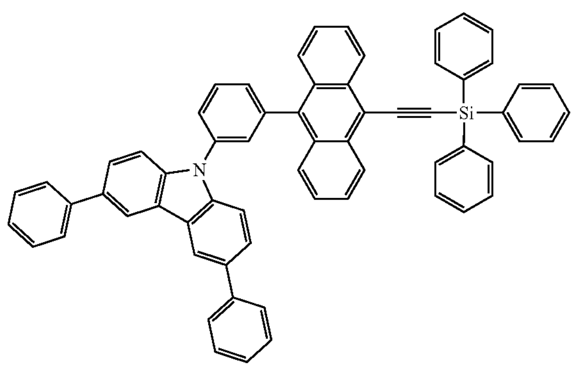
82
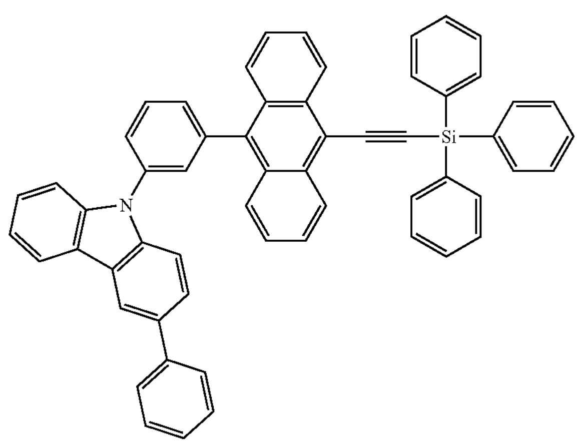
83
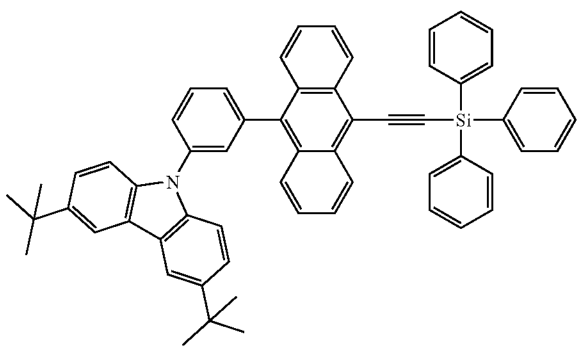
84
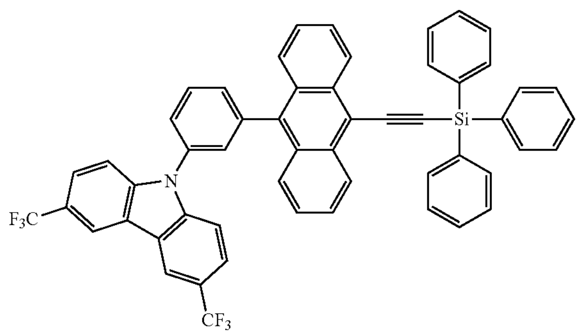
85
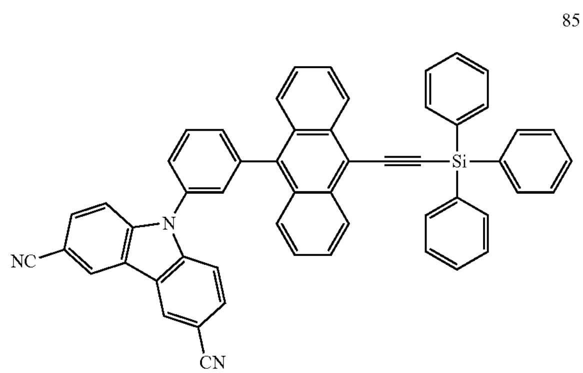

-continued
86
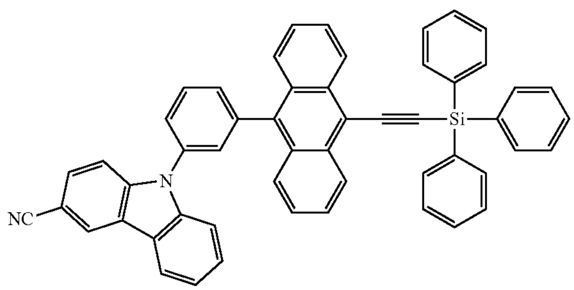
87
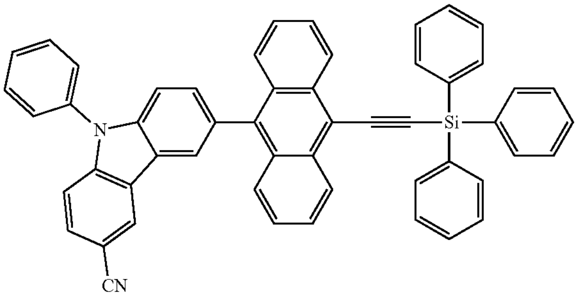
88
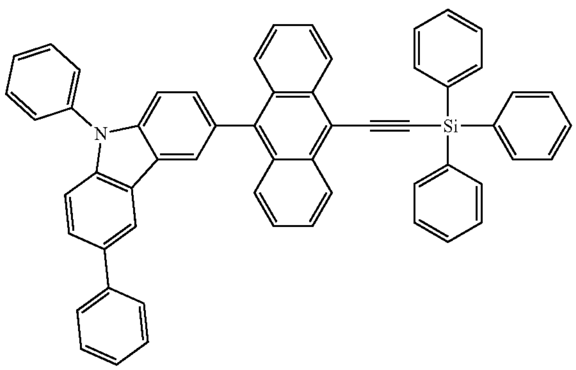
89
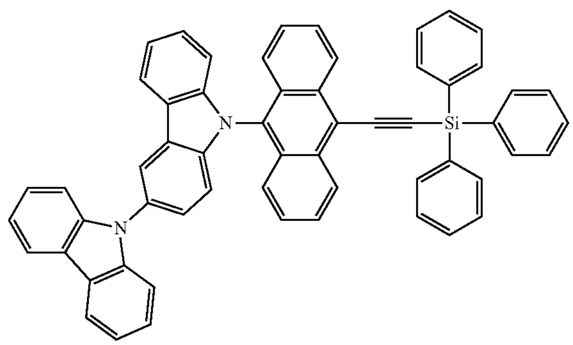
-continued
90
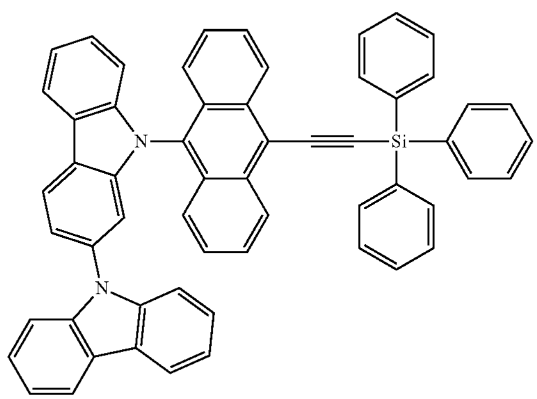
91
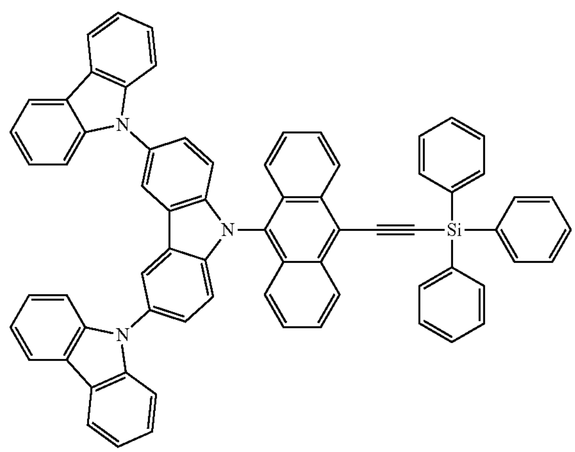
92
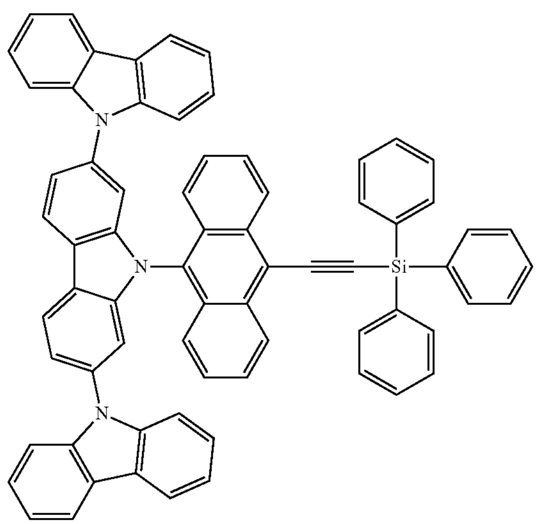

-continued
93
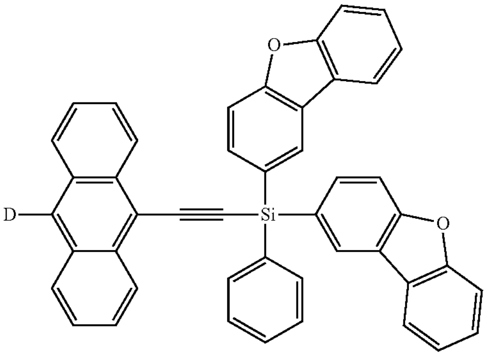
94
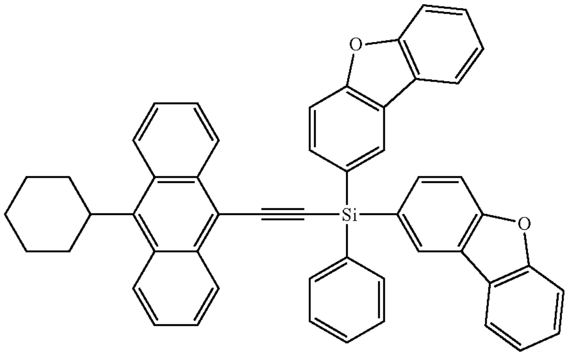
95
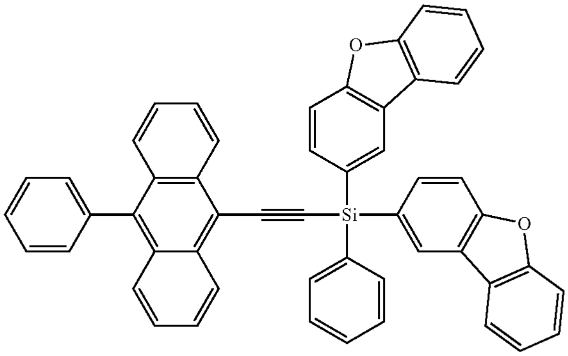
96
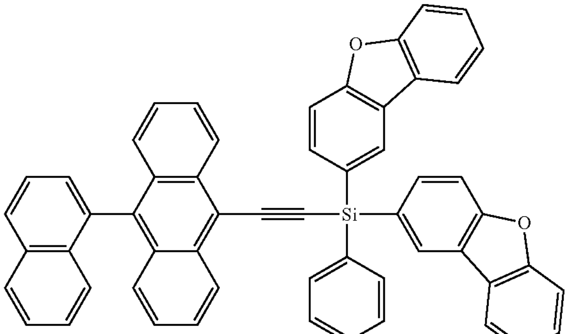
-continued
97
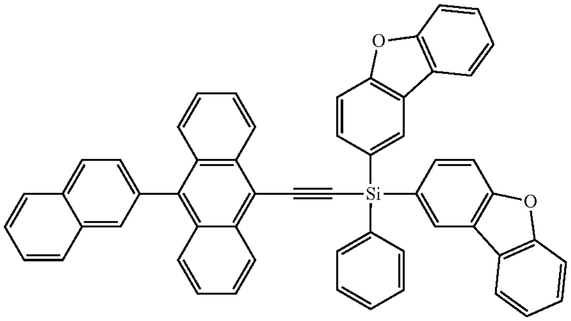
98
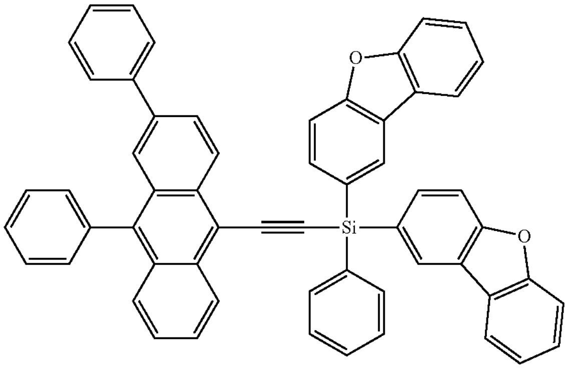
99
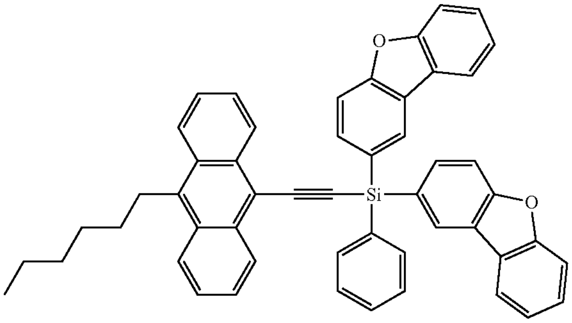
100
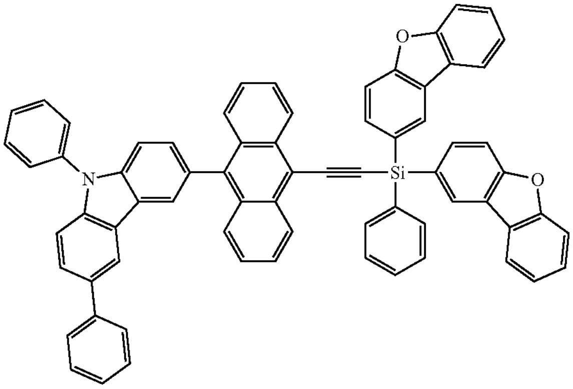

-continued
101
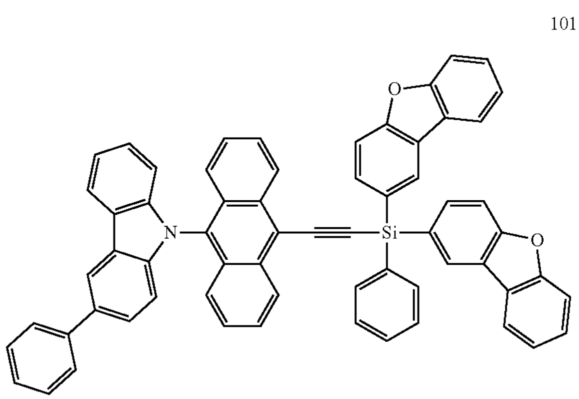
102
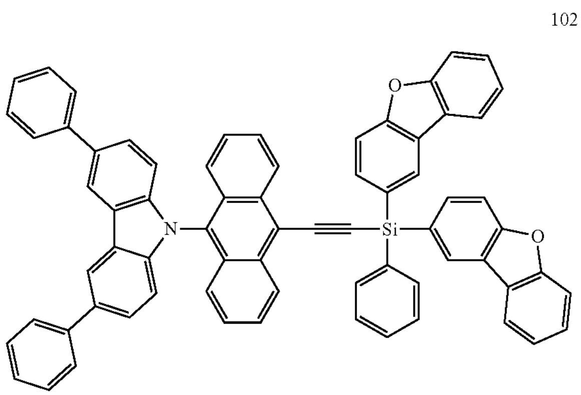
103
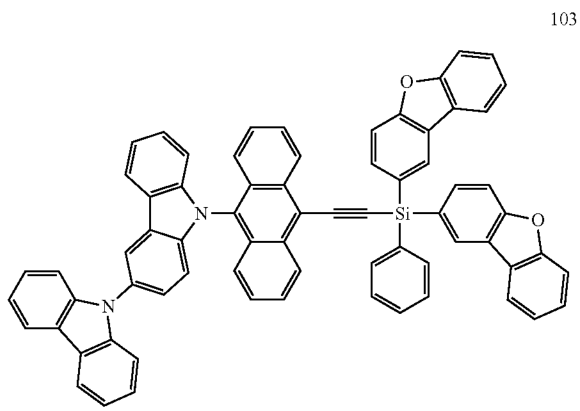
104
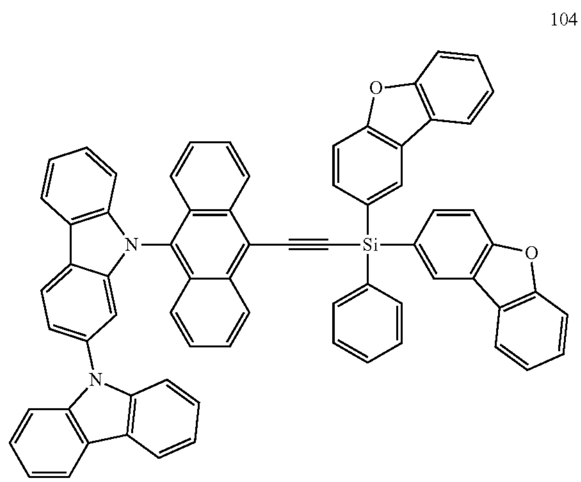
-continued
105
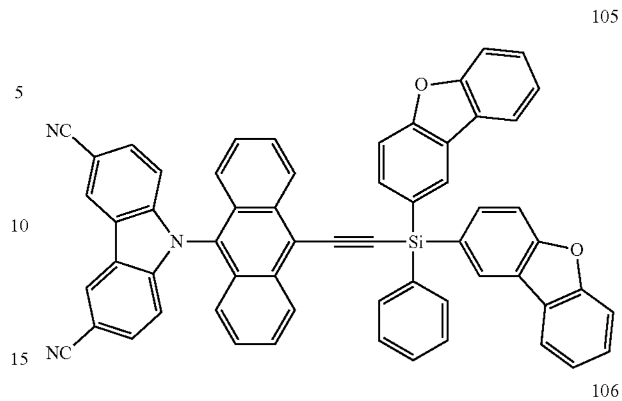
106
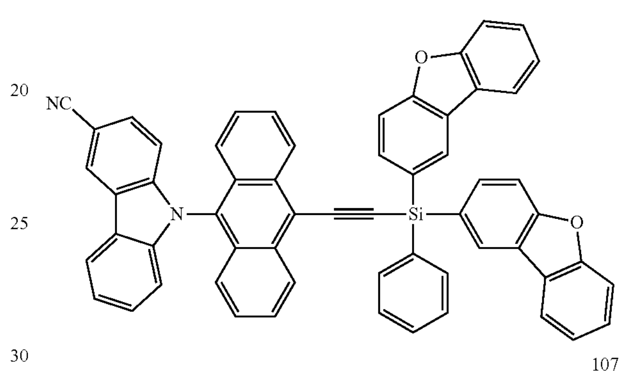
107
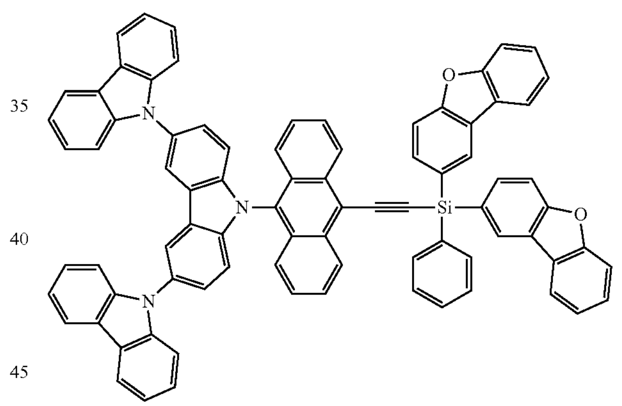
108
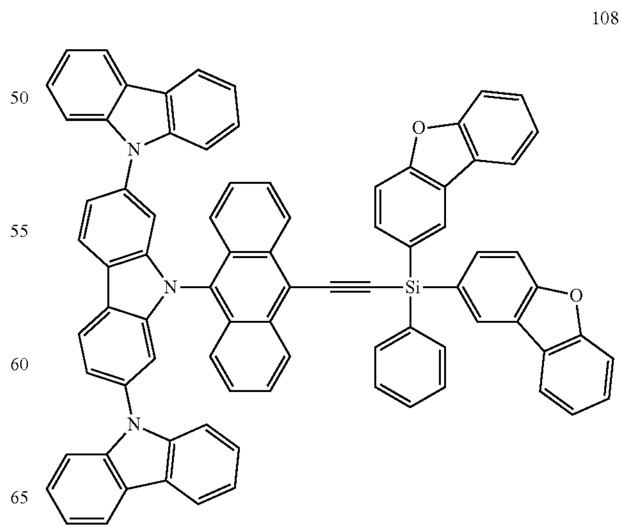

-continued
109
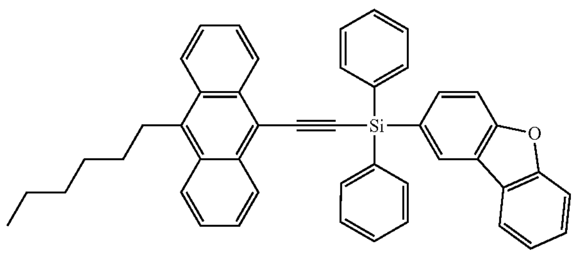
110
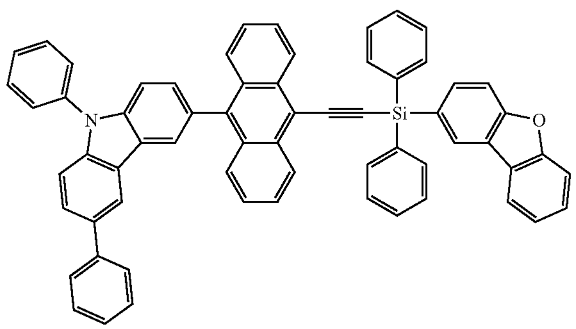
111
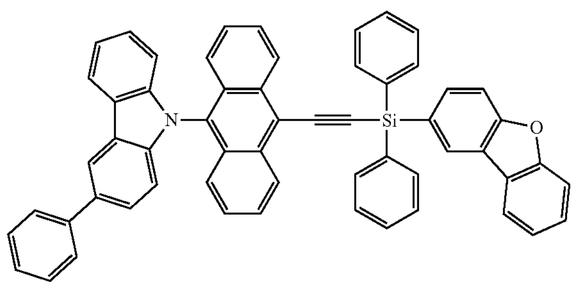
112
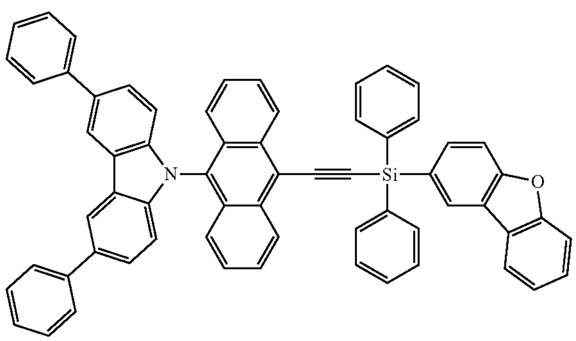
113
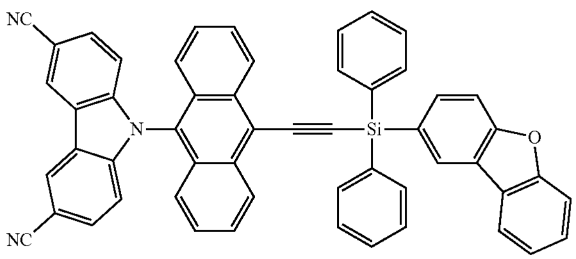
-continued
114
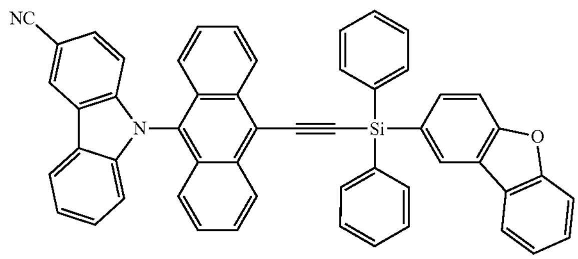
115
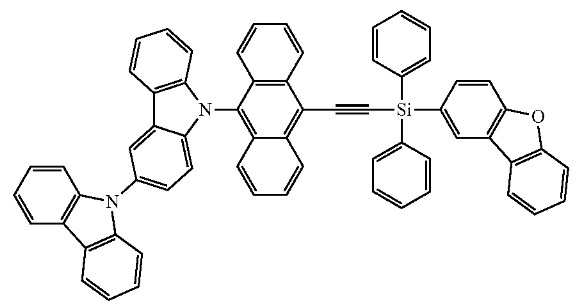
116
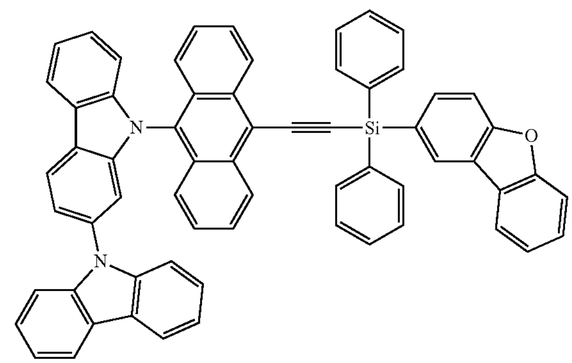
117
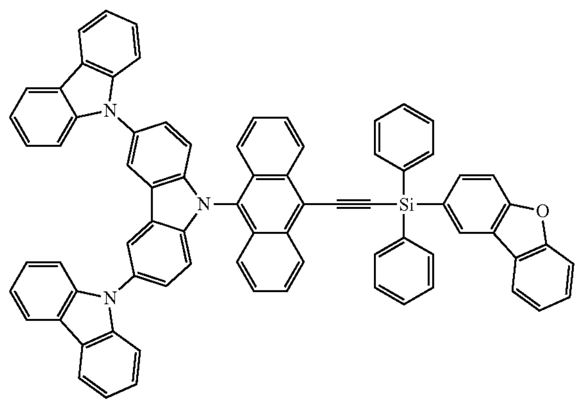

-continued
118
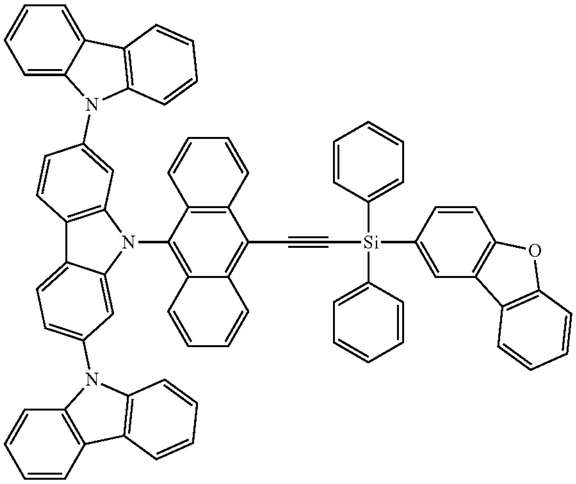
119
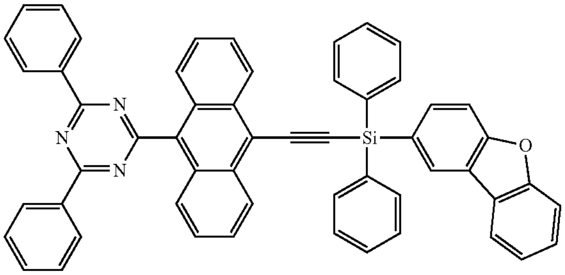
120
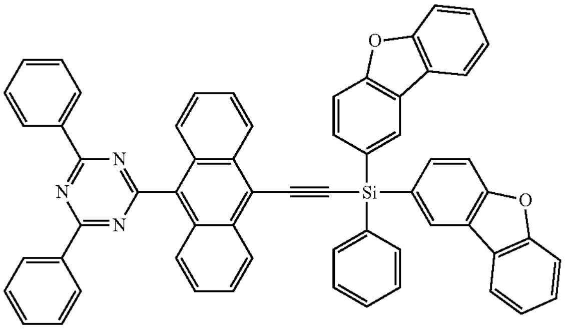
121
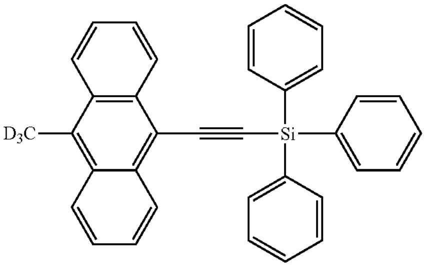
-continued
122
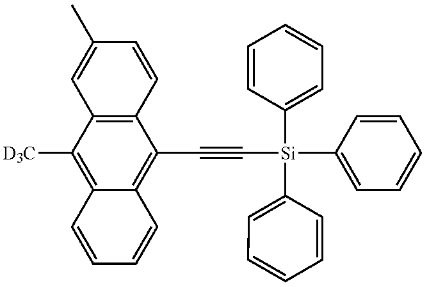
123
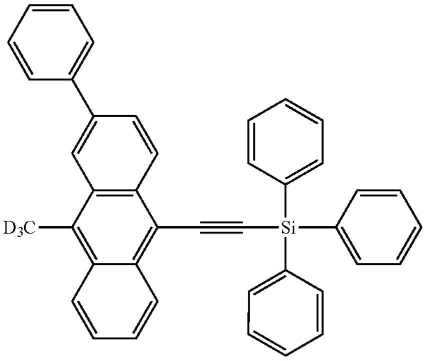
124
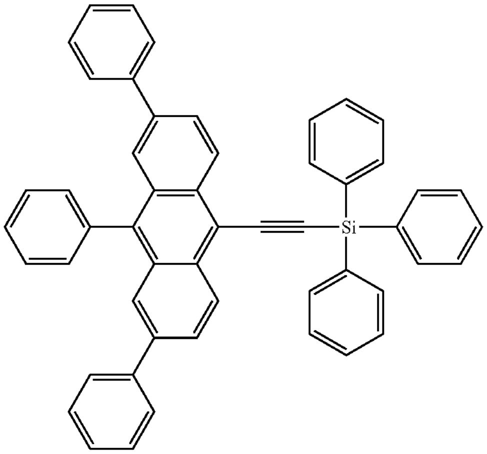
125
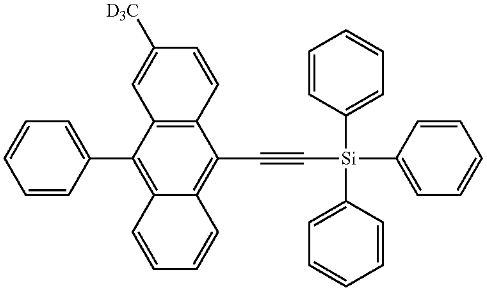

-continued
126
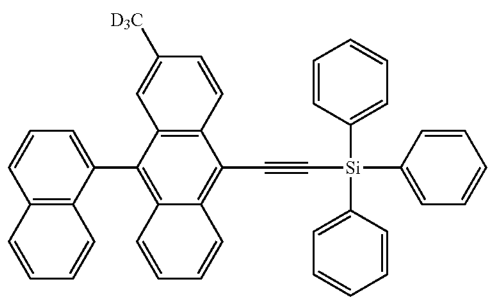
127
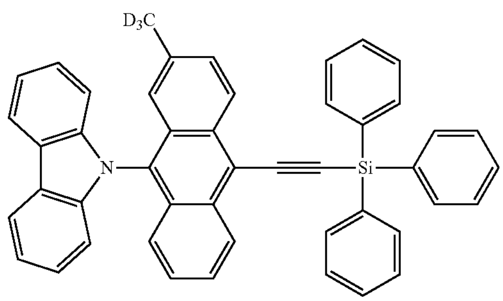
128
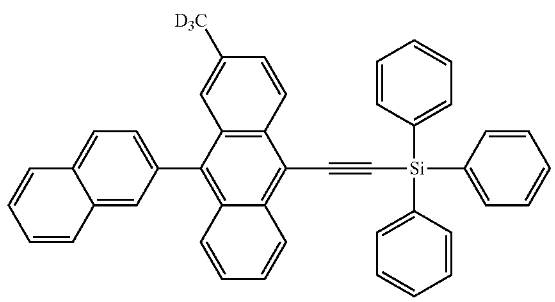
129
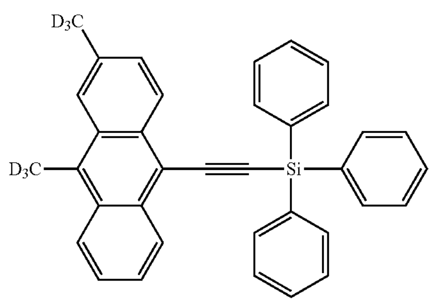
130
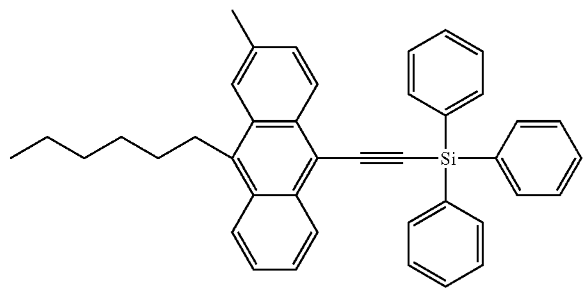
-continued
131
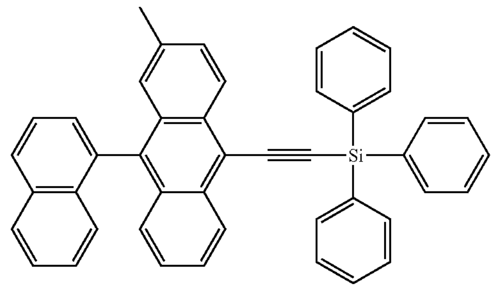
132
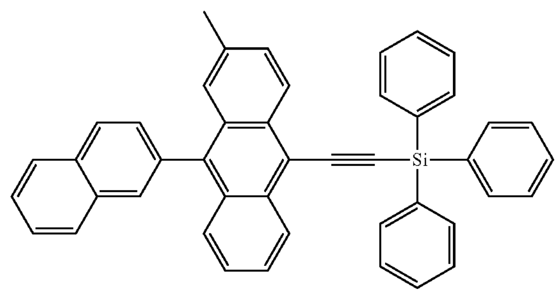
133
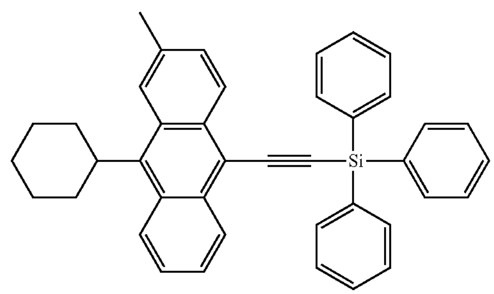
134
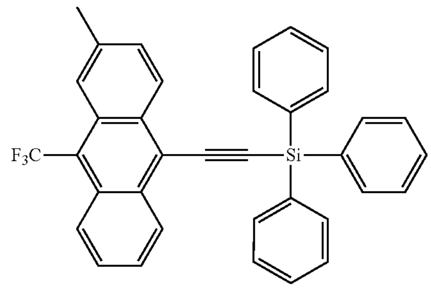
135
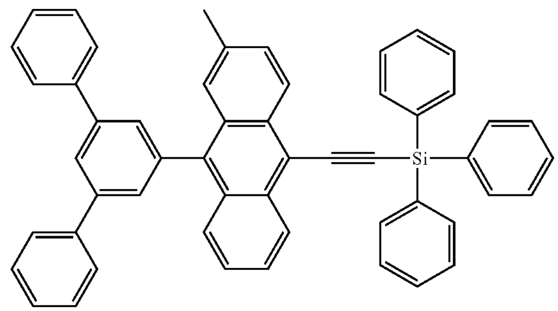

-continued
136
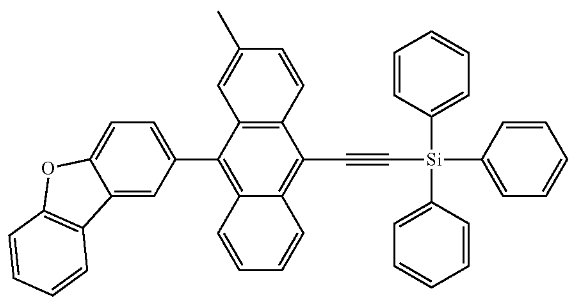
137
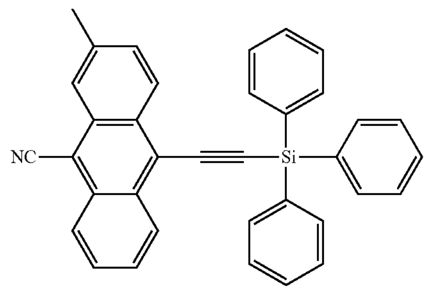
138
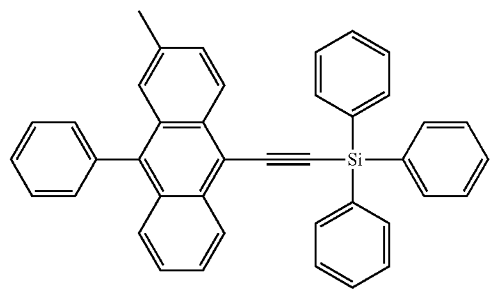
139
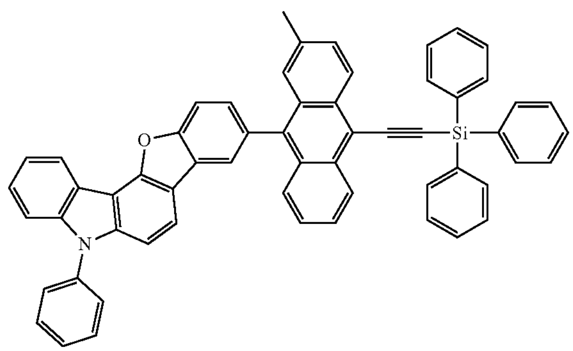
140
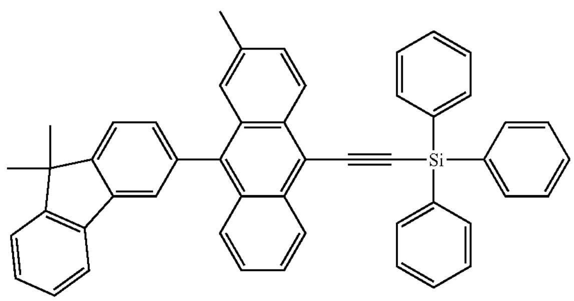
-continued
141
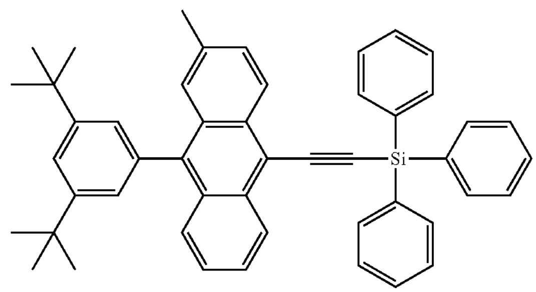
142
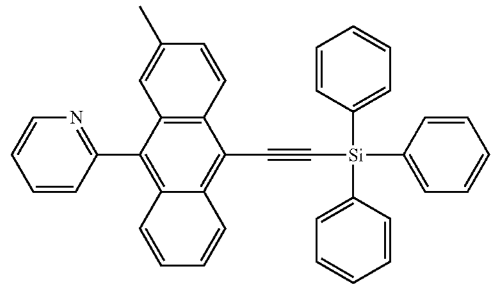
143
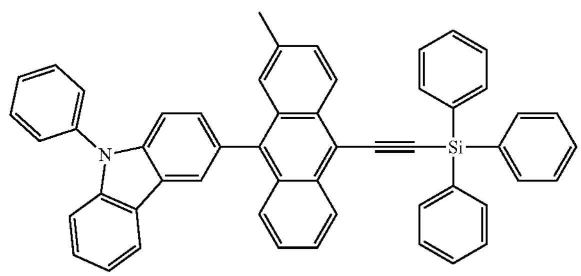
144
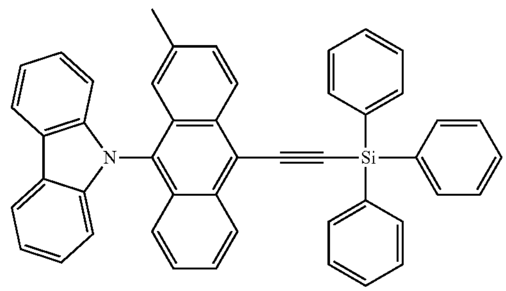
145
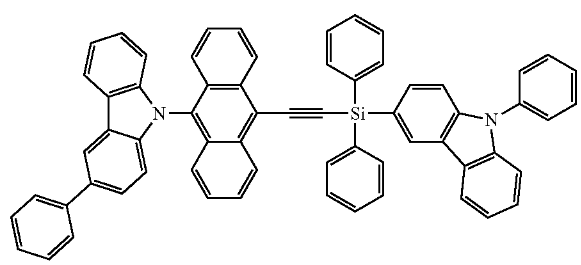

-continued
146
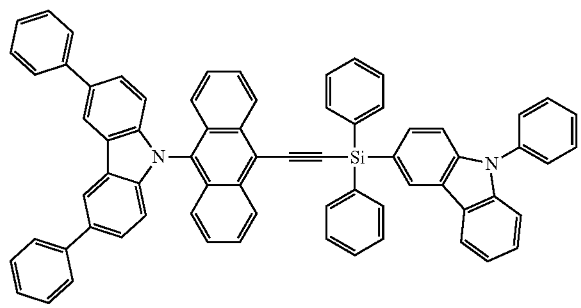
147
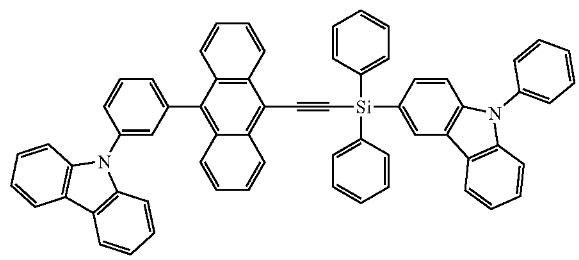
148
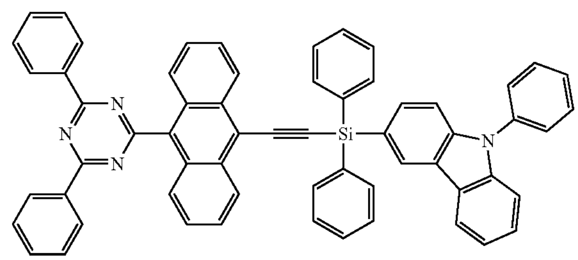
149
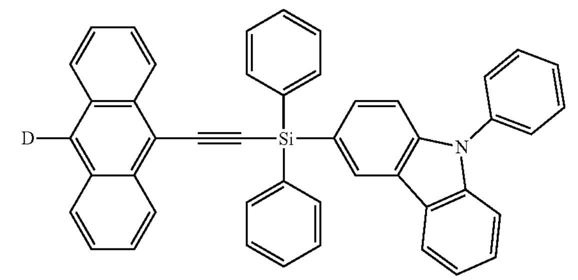
150
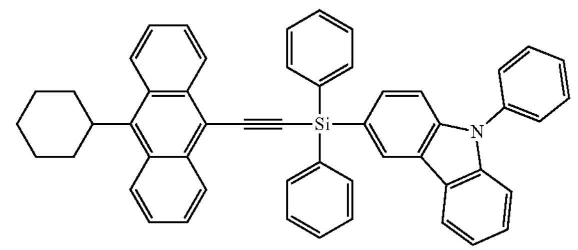
-continued
151
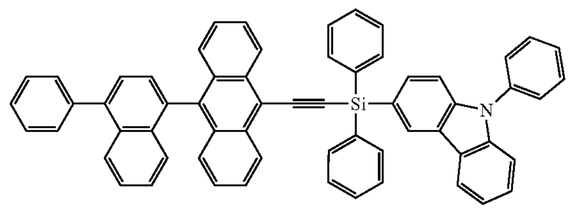
152
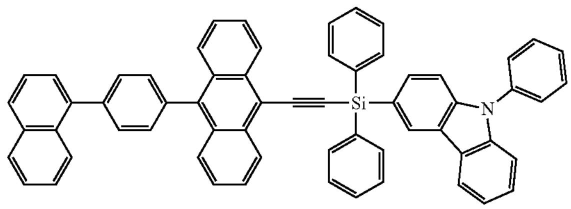
153
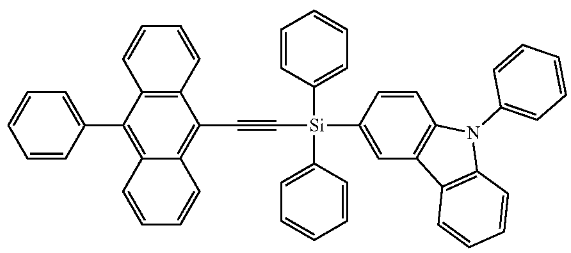
154
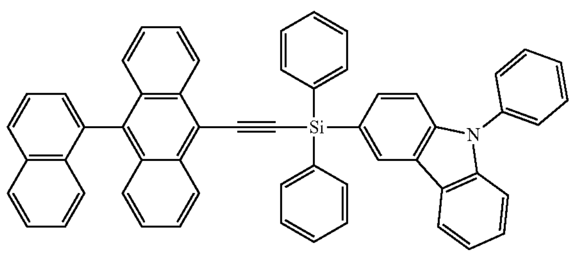
155
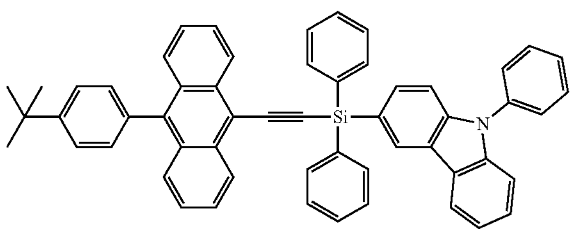
156
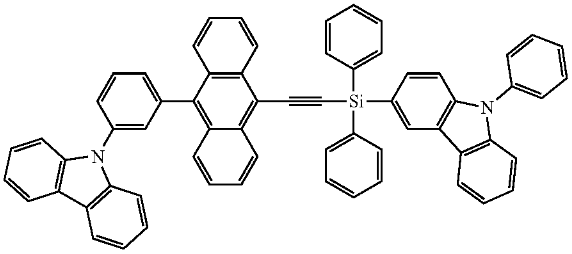

-continued

157

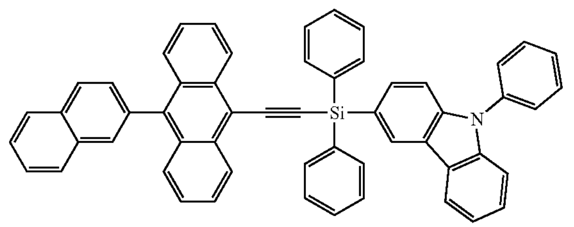

158

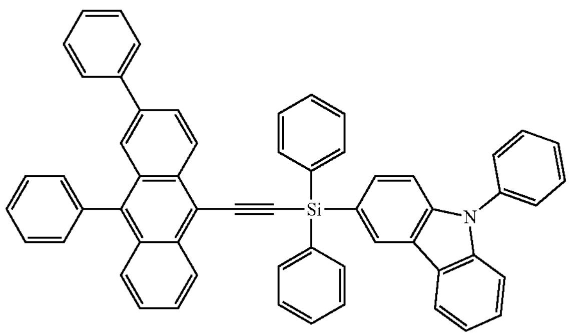

159

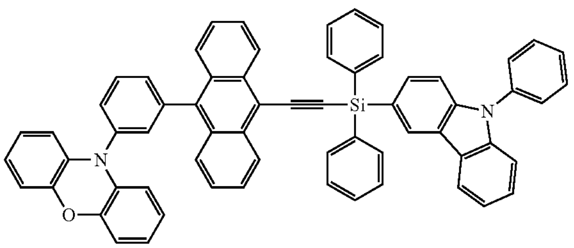

160

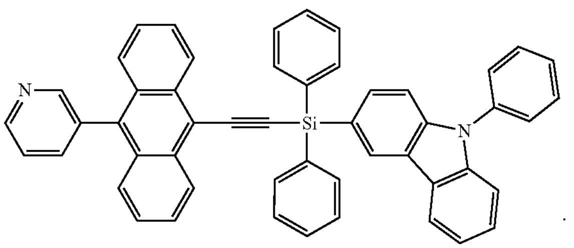

In one or more embodiments, the fluorescent host may be represented by Formula FH-2:

Formula FH-2

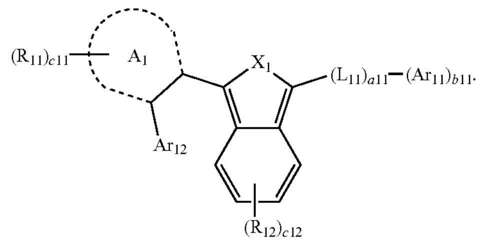

In Formula FH-2, $X_1$ may be O or S, $A_1$ may be a $C_5$-$C_{60}$ carbocyclic group or a $C_1$-$C_{60}$ heterocyclic group, $L_{11}$ may be an unsubstituted or substituted $C_5$-$C_{60}$ carbocyclic group or an unsubstituted or substituted $C_1$-$C_{60}$ heterocyclic group, a11 may be an integer from 0 to 3, $Ar_{11}$ and $Ar_{12}$ may each independently be a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with at least one $R_a$, b11 may be an integer from 1 to 5, $R_{11}$, $R_{12}$, and $R_a$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, or —$B(Q_6)(Q_7)$, c11 may be an integer from 1 to 20, c12 may be an integer from 1 to 4, when c11 is 2 or more, two neighboring $R_{11}$(s) may optionally be linked to each other to form a substituted or unsubstituted $C_5$-$C_{30}$ carbocyclic group or a substituted or unsubstituted $C_1$-$C_{30}$ heterocyclic group, when c12 is 2 or more, two neighboring $R_{12}$(s) may optionally be linked to each other to form a substituted or unsubstituted $C_5$-$C_{30}$ carbocyclic group or a substituted or unsubstituted $C_1$-$C_{30}$ heterocyclic group, $A_1$ and $Ar_{12}$ may optionally be linked to each other via a first linking group a single bond, *—$Ar_{31}$—*', *—O—*', *—S—*', *—$[C(R_{31})(R_{32})]_{k11}$—*', *—$C(R_{31})$=*', *=$C(R_{31})$—*', *—$C(R_{31})$=$C(R_{32})$—*', *—C(=O)—*', *—C(=S)—*', *—C≡C—*', *—$N(R_{31})$—*', *—$P(R_{31})$—*', *—$[Si(R_{31})(R_{32})]_{k11}$—*, or *—$P(R_{31})(R_{32})$—*' to form a substituted or unsubstituted $C_5$-$C_{30}$ carbocyclic group or a substituted or unsubstituted $C_1$-$C_{30}$ heterocyclic group, $Ar_{31}$ may be a $C_5$-$C_{30}$ carbocyclic group, $R_{31}$ and $R_{32}$ may each be the same as described in connection with $R_{11}$, and k11 may be 1, 2, 3, or 4.

In detail, the fluorescent host represented by Formula FH-2 may be a compound of Group FH2, embodiments of the present disclosure are not limited thereto:

Group FH2
1
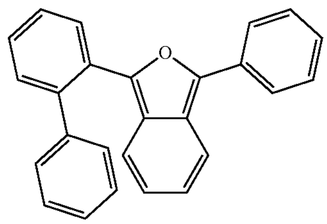
2
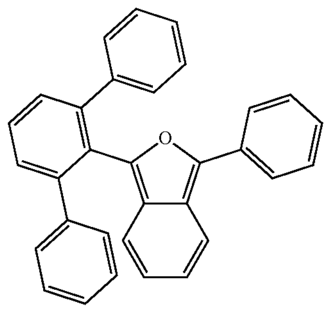
3
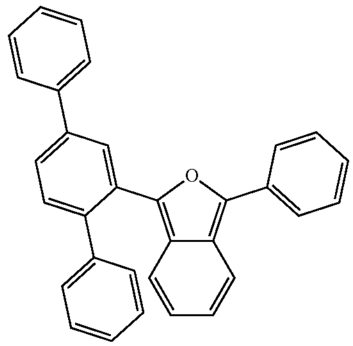
4
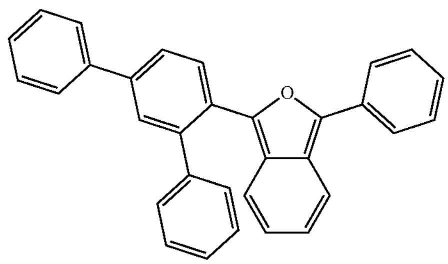
5
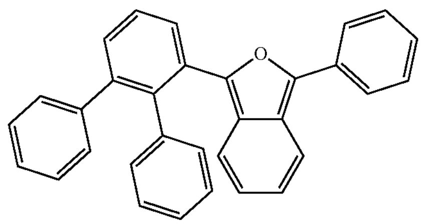
-continued
6
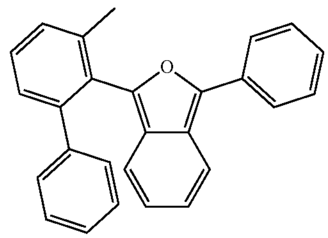
7
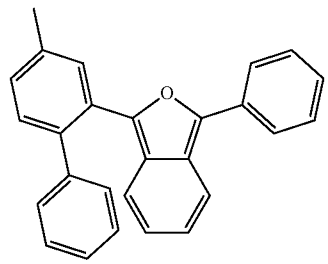
8
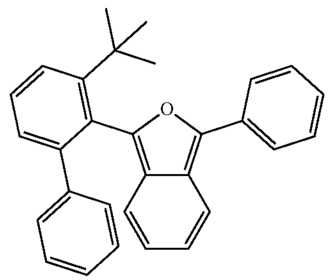
9
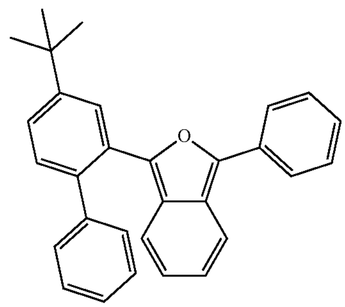
10
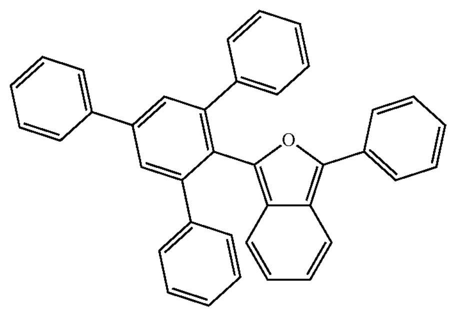

-continued
11
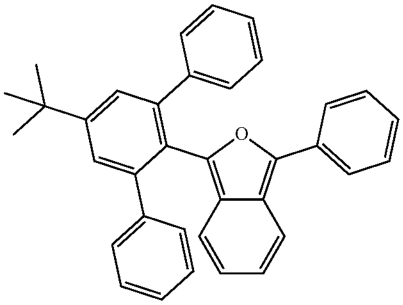
12
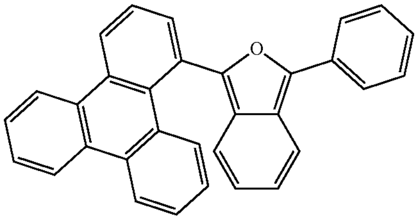
13
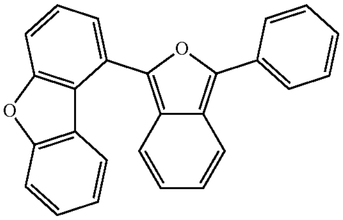
14
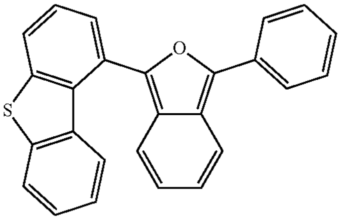
15
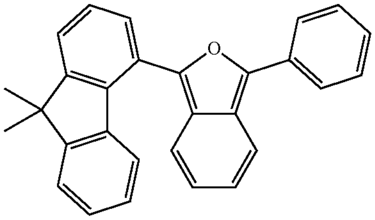
16
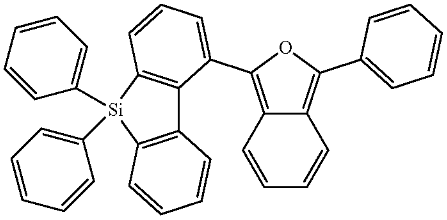
-continued
17
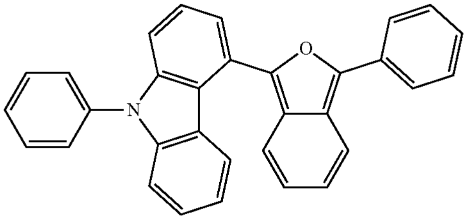
18
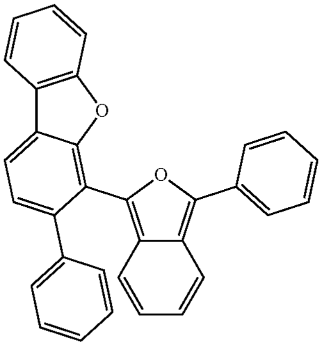
19
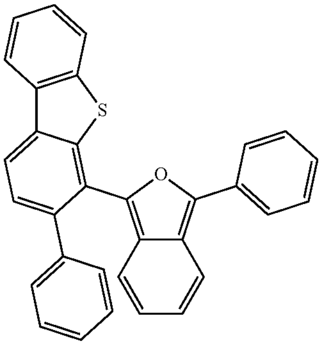
20
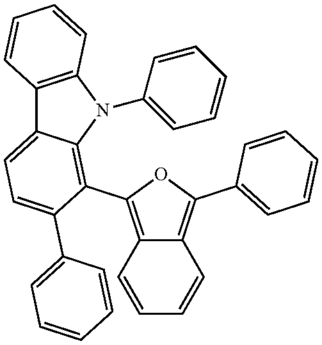
21
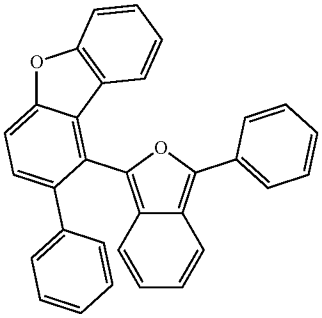

-continued
22
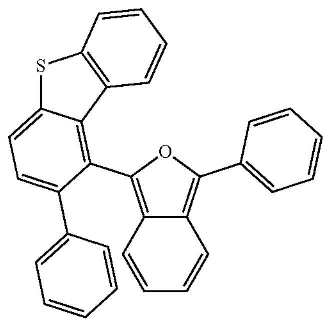
23
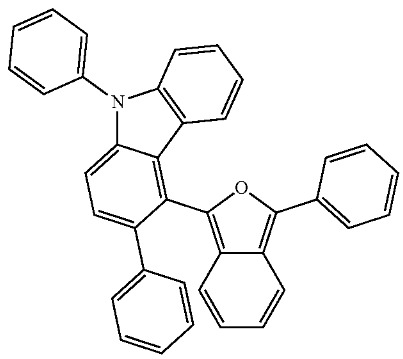
24
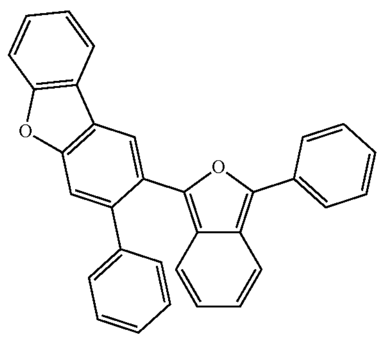
25
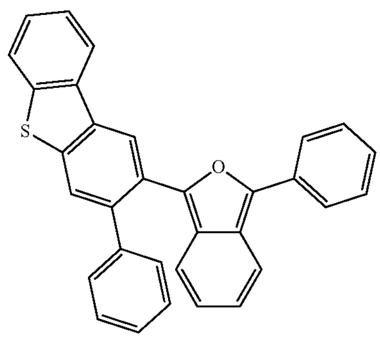
-continued
26
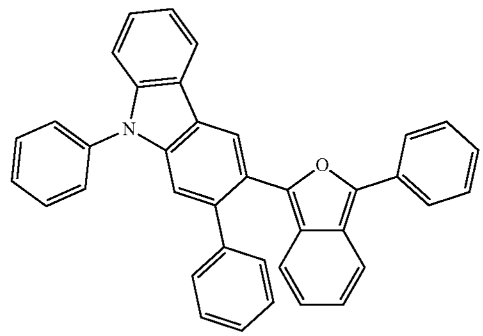
27
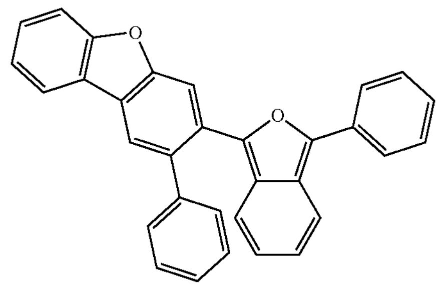
28
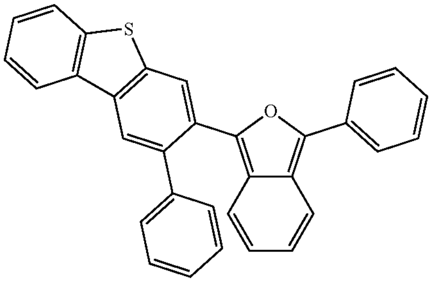
29
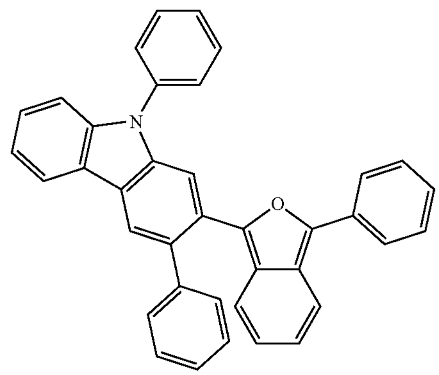
30
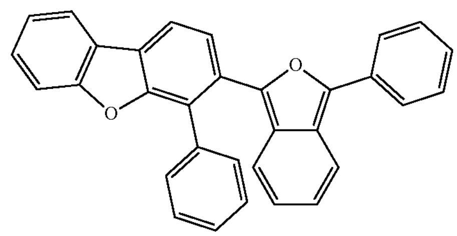

-continued
31
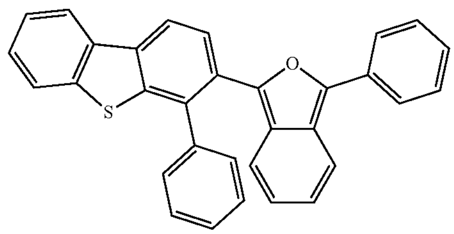
31
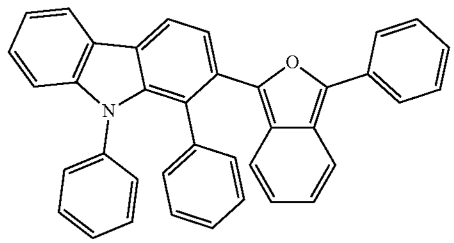
33
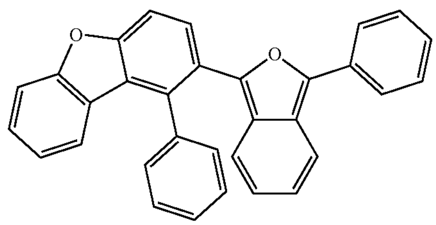
34
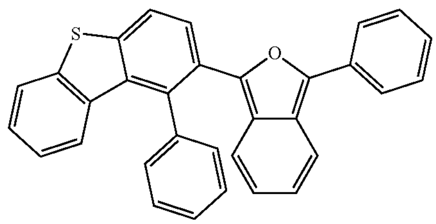
35
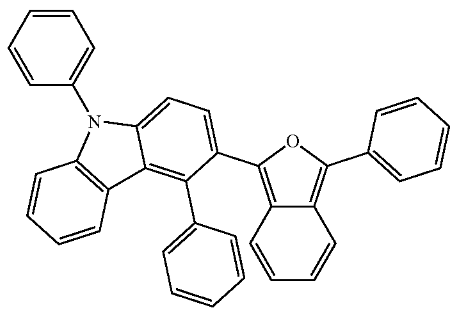
36
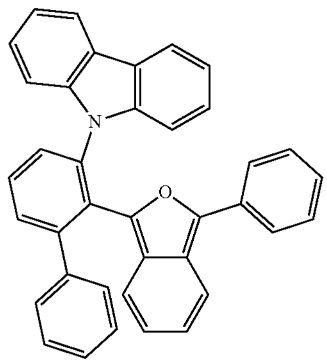
-continued
37
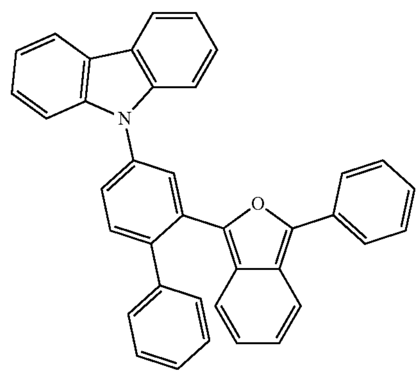
38
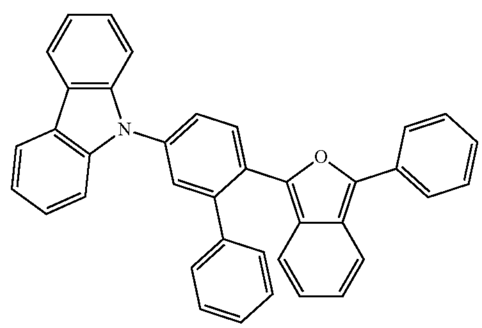
39
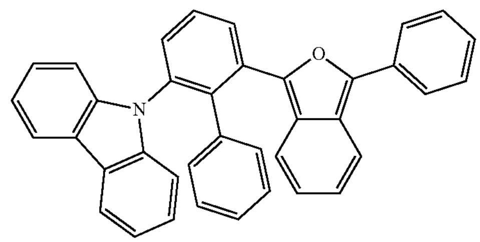
40
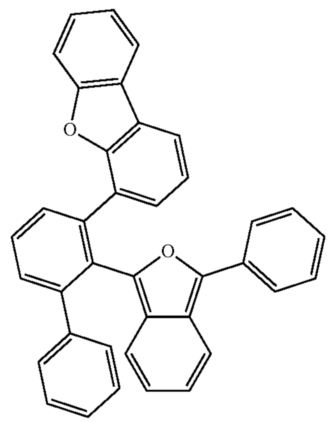

-continued
41
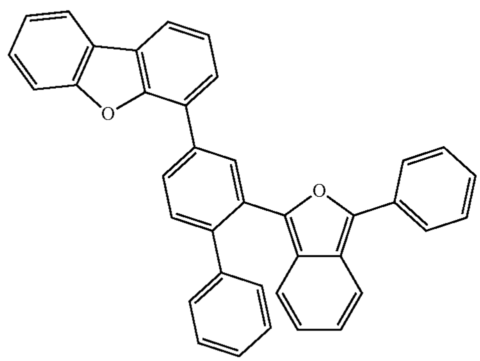
42
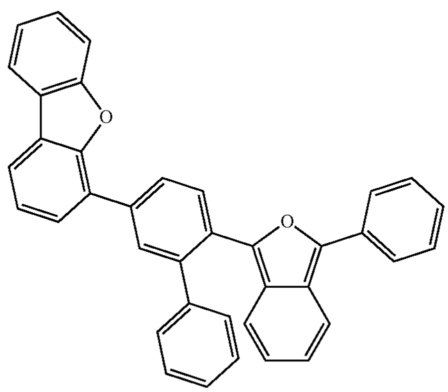
43
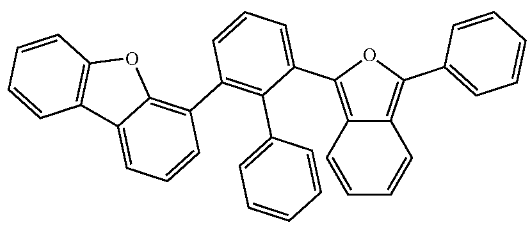
44
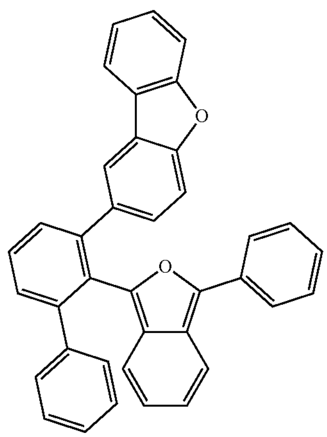
-continued
45
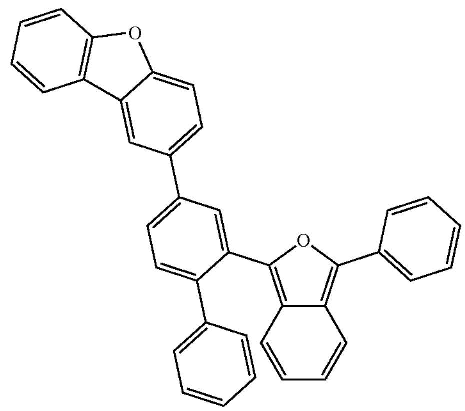
46
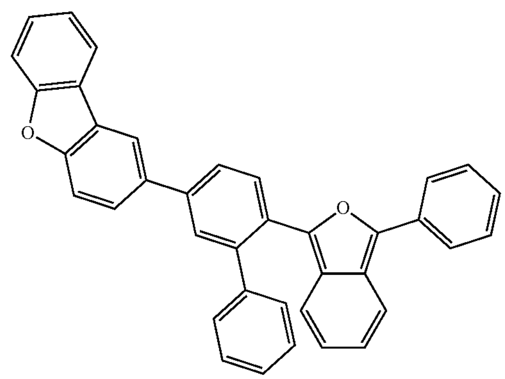
47
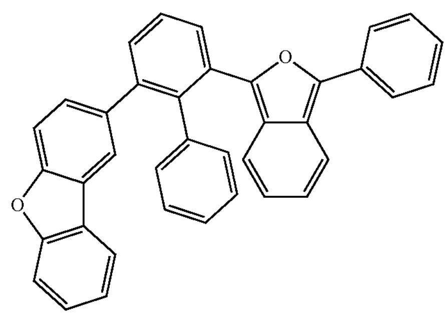
48
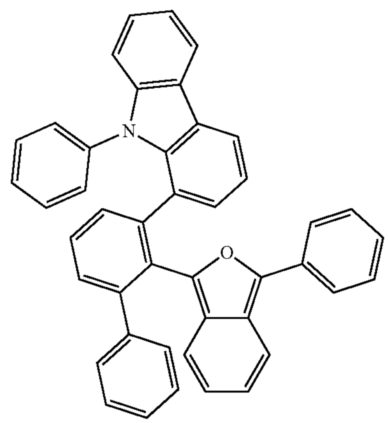

-continued
49
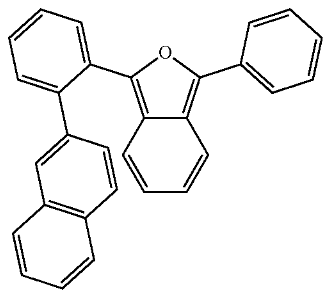
50
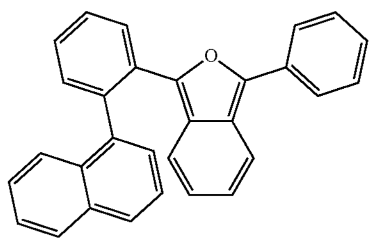
51
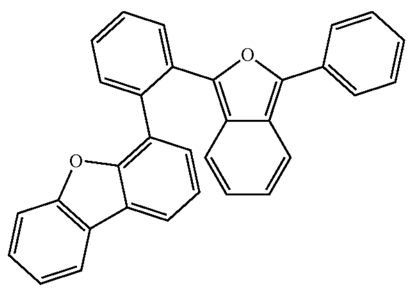
52
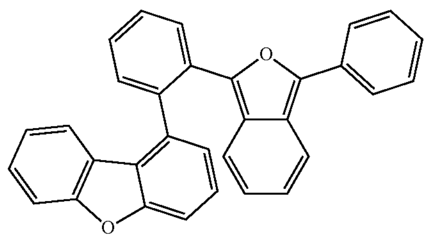
53
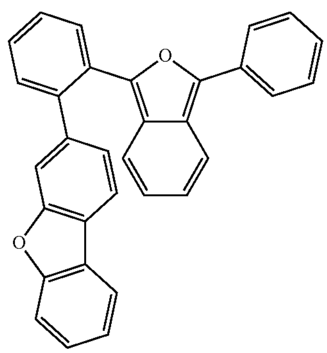
-continued
54
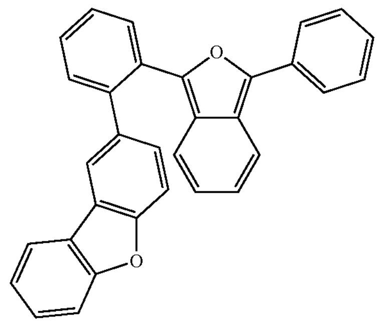
55
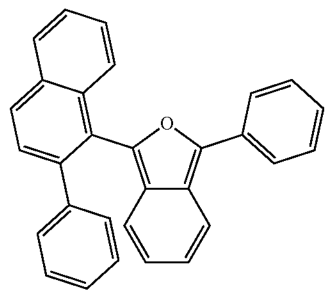
56
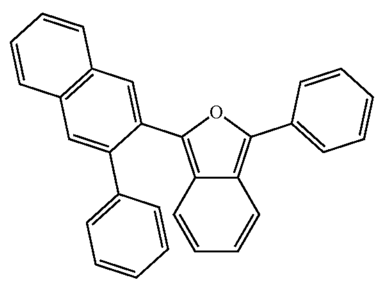
57
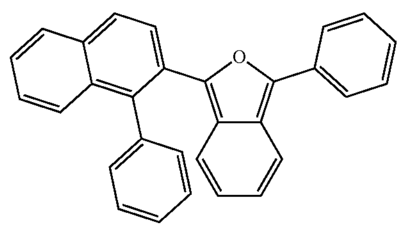
58
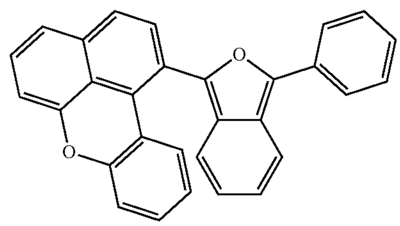

-continued
59
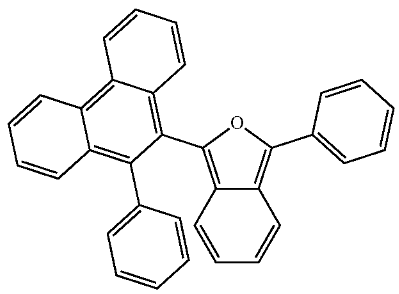
60
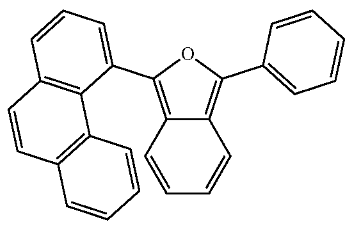
61
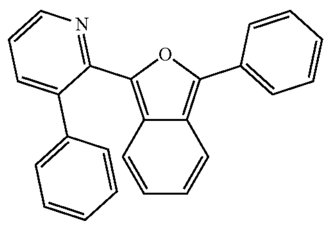
62
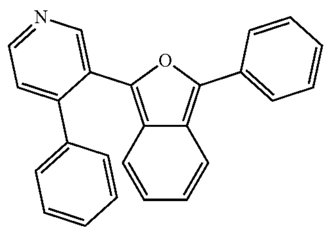
63
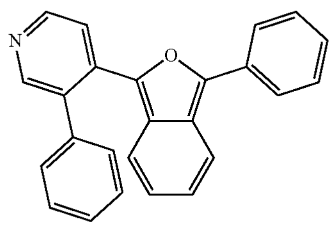
64
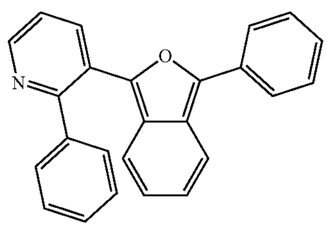
-continued
65
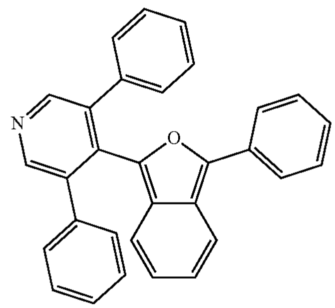
66
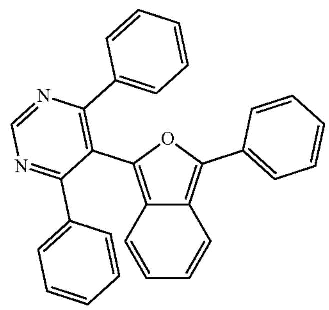
67
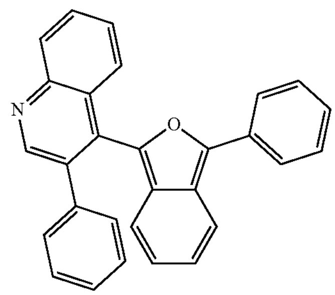
68
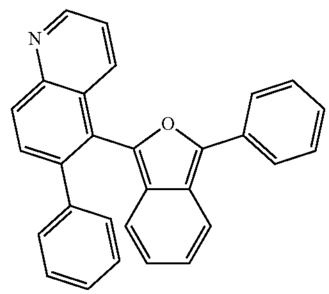
69
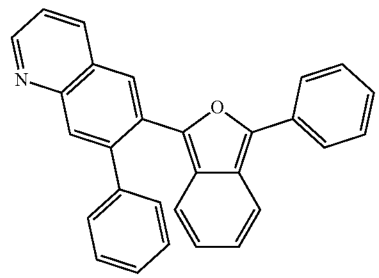

-continued
70
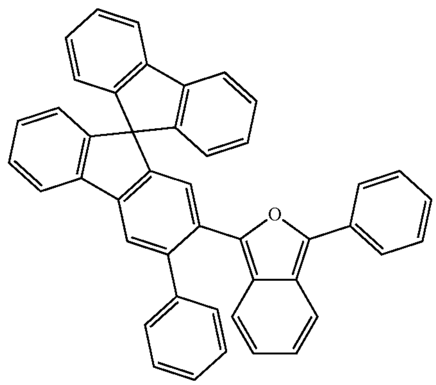
71
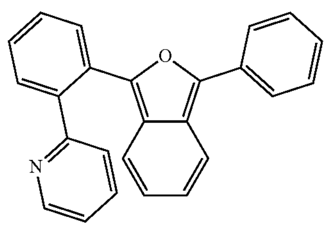
72
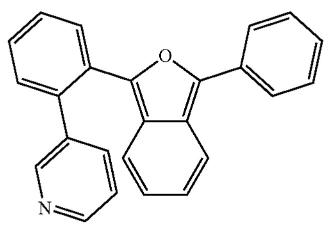
73
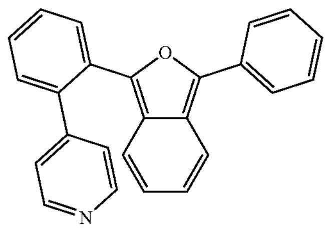
74
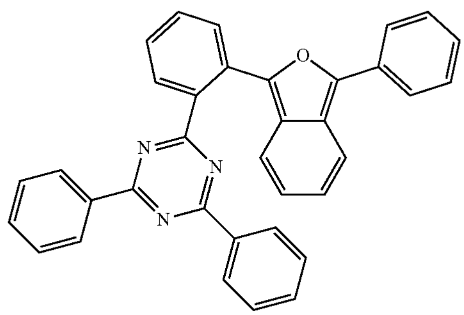
-continued
75
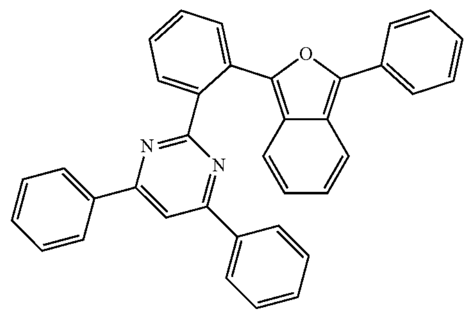
76
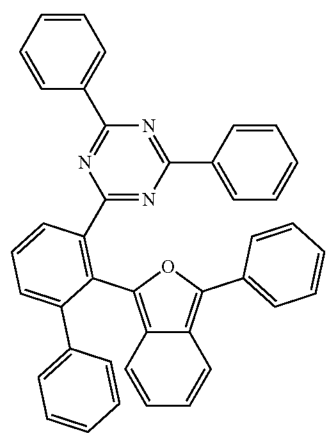
77
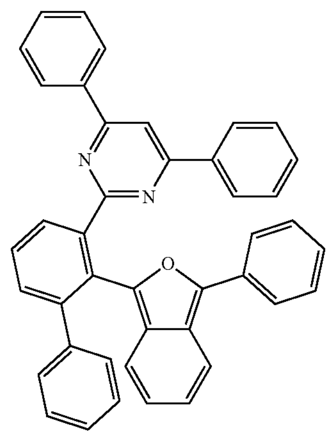
78
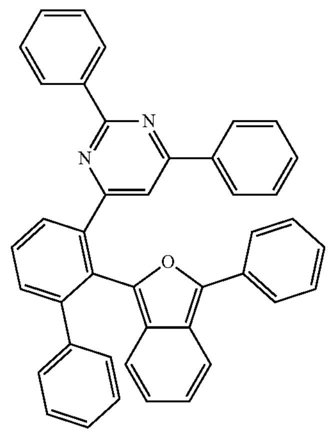

-continued
79
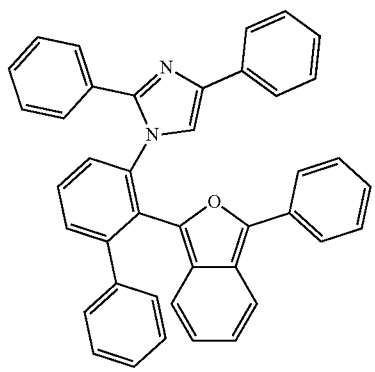
80
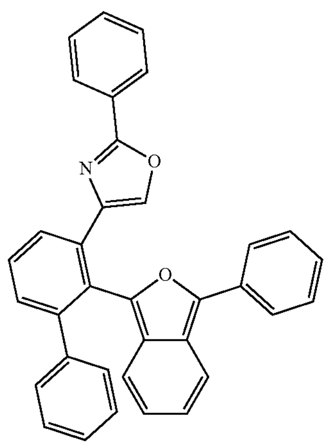
81
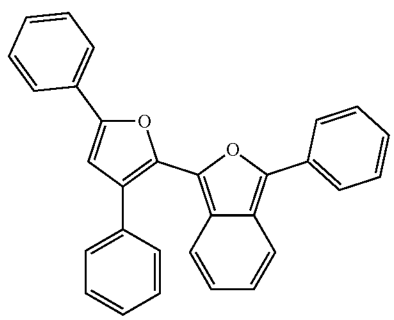
82
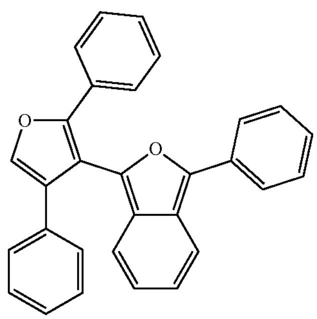
-continued
83
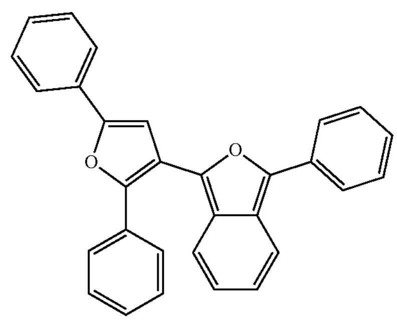
84
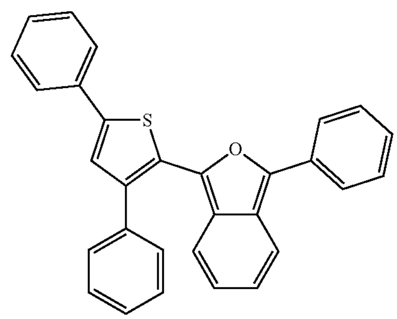
85
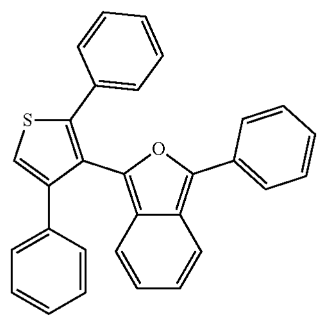
86
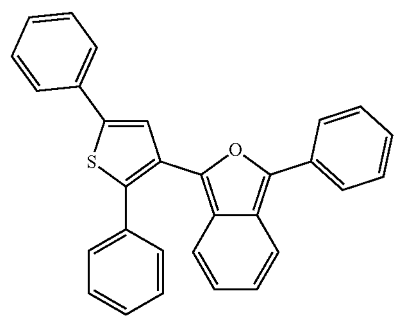
87
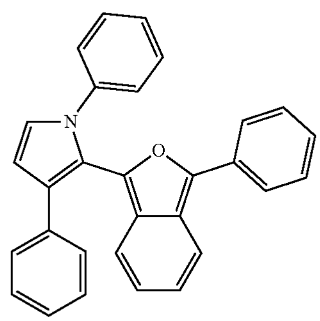

-continued
88
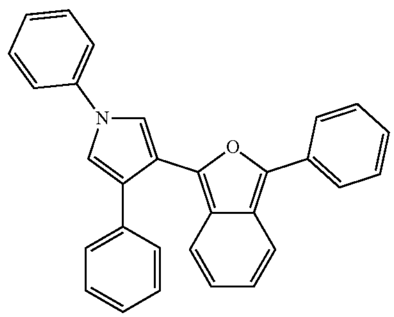
89
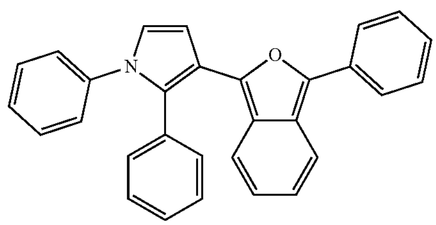
90
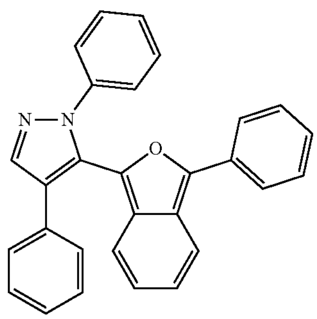
91
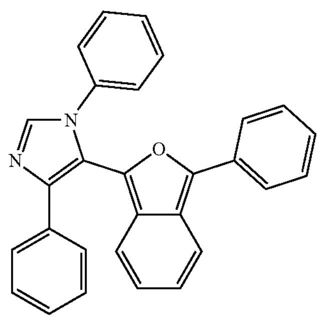
92
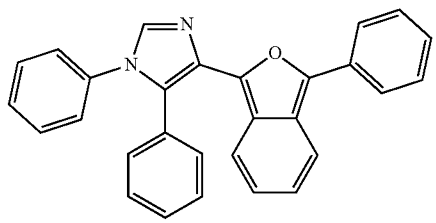
93
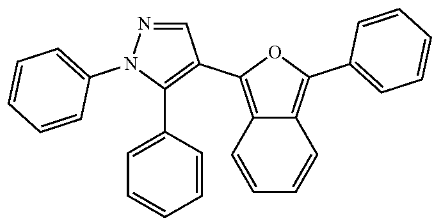
-continued
94
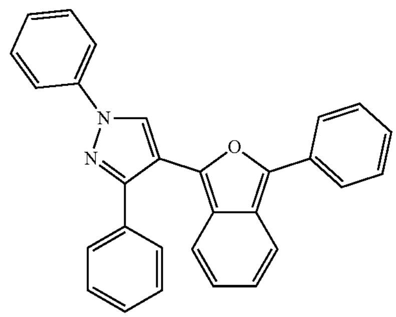
95
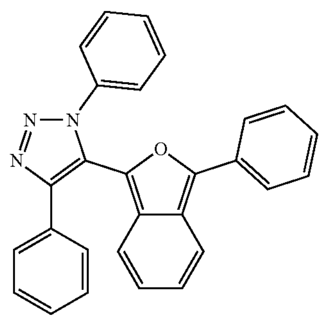
96
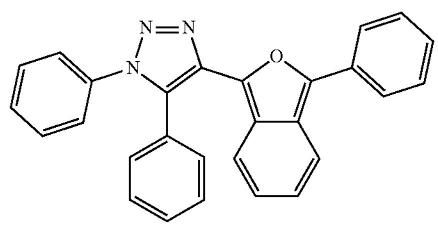
97
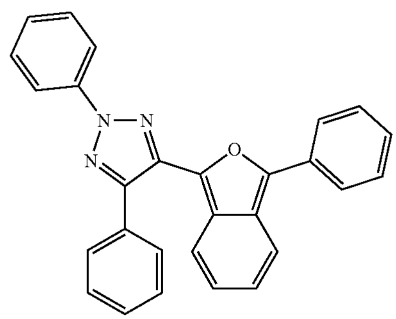
98
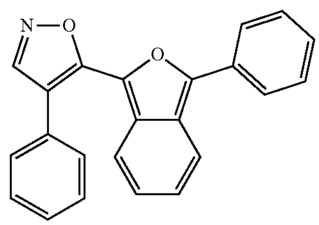
99
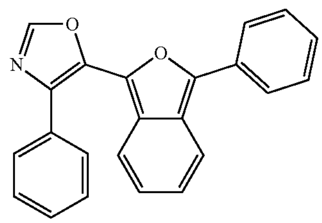

-continued
100
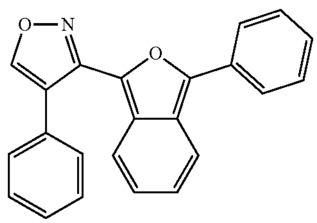
101
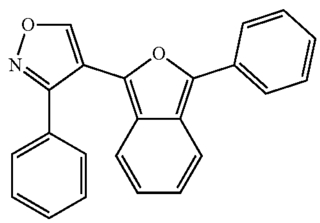
102
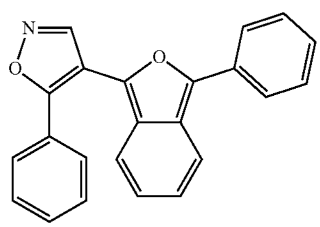
103
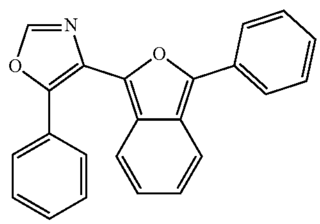
104
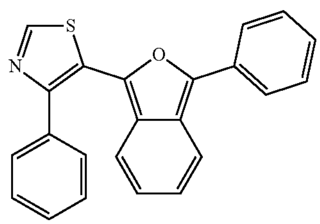
105
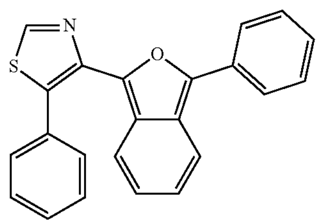
106
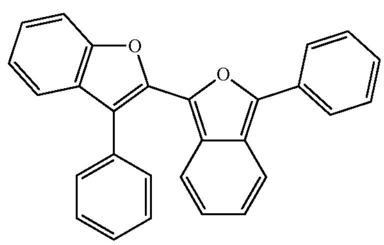
-continued
107
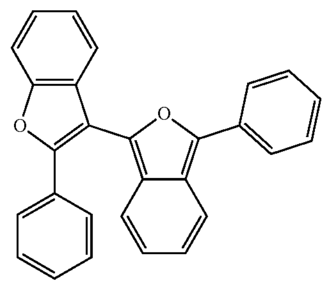
108
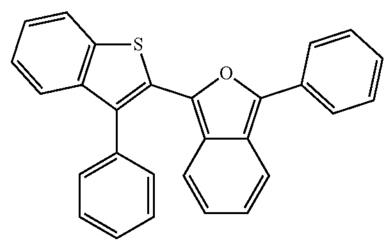
109
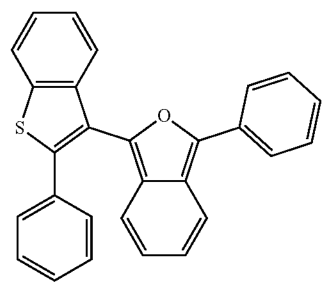
110
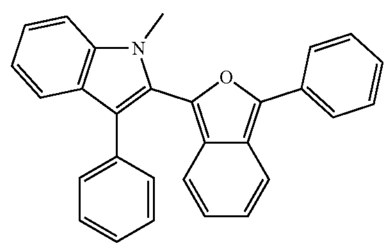
111
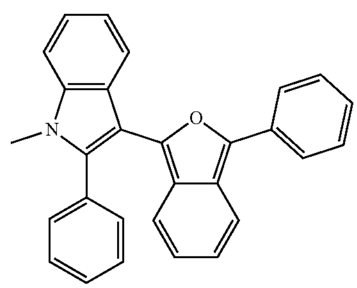

-continued
112
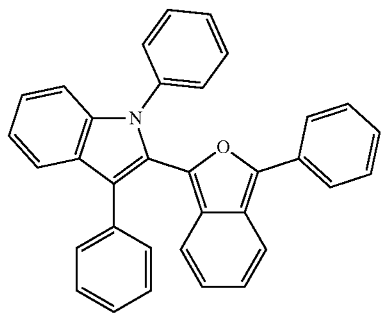
113
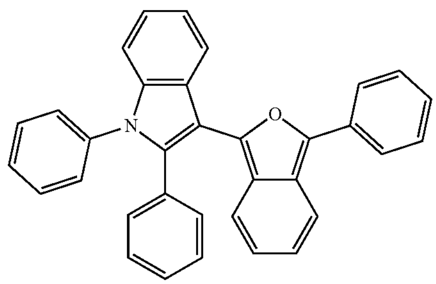
114
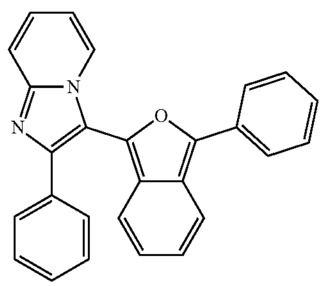
115
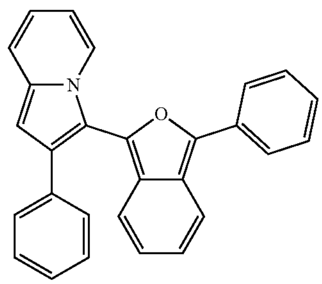
116
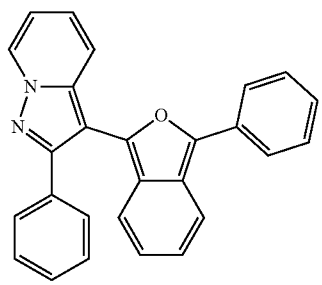
-continued
117
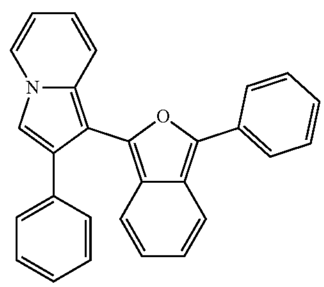
118
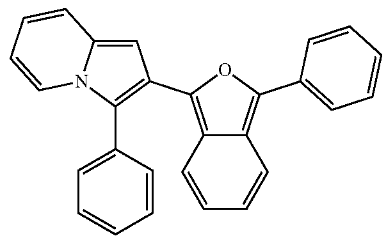
119
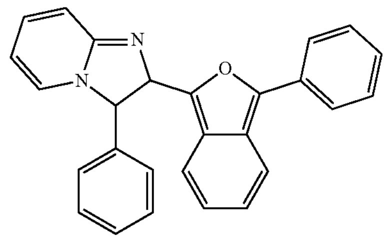
120
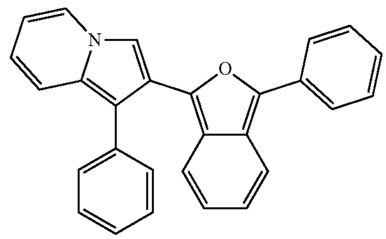
121
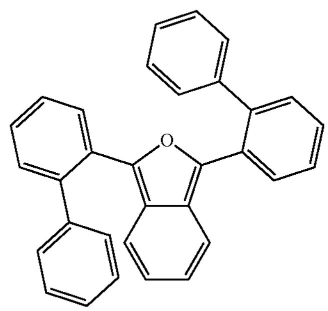
122
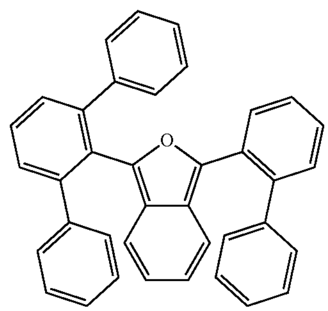

-continued
123
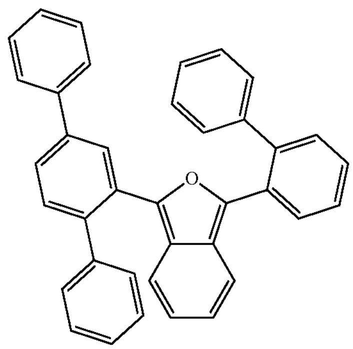
124
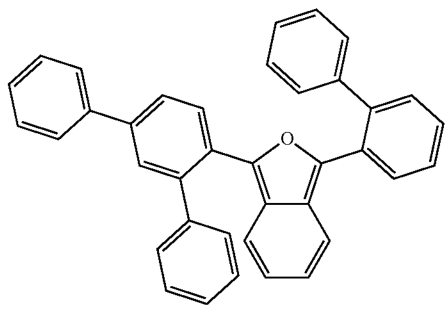
125
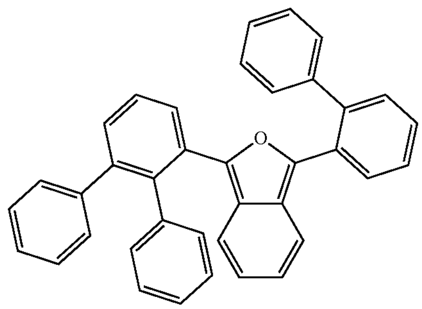
126
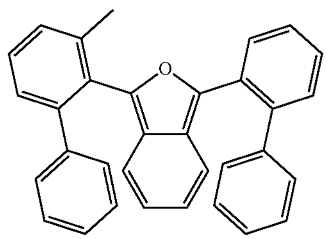
127
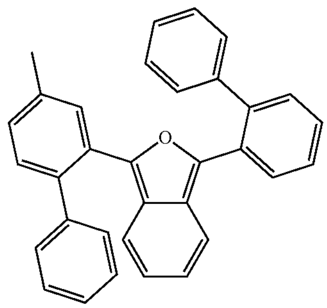
-continued
128
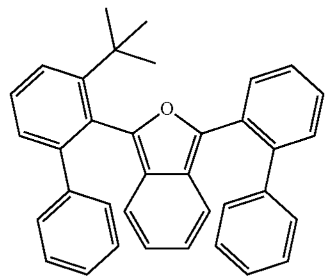
129
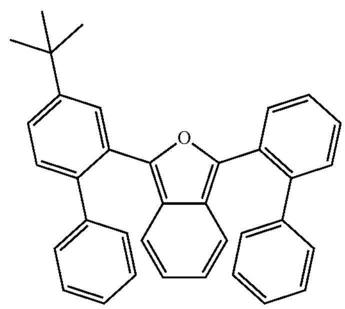
130
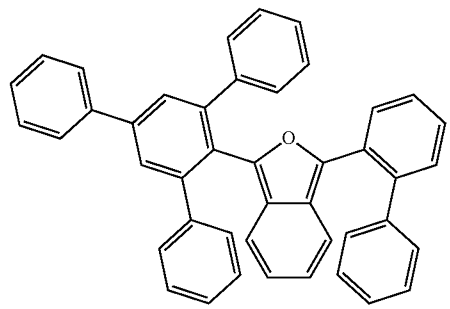
131
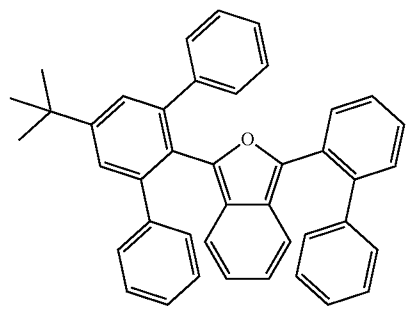
132
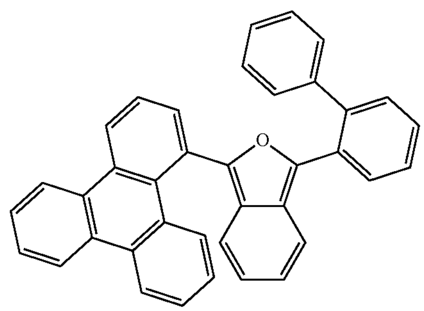

-continued
133
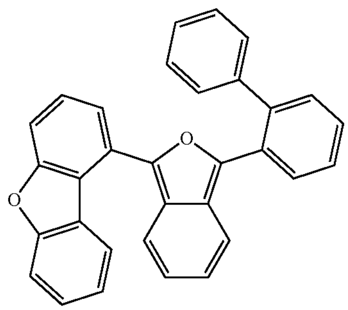
134
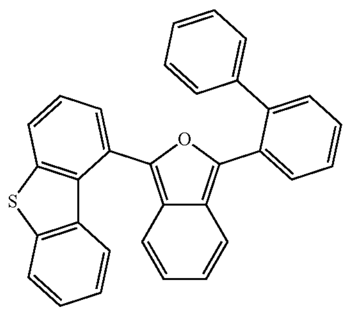
135
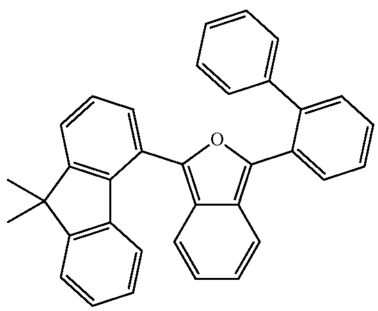
136
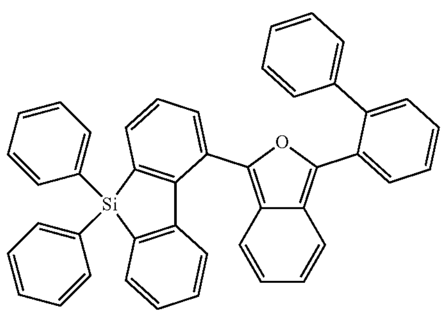
137
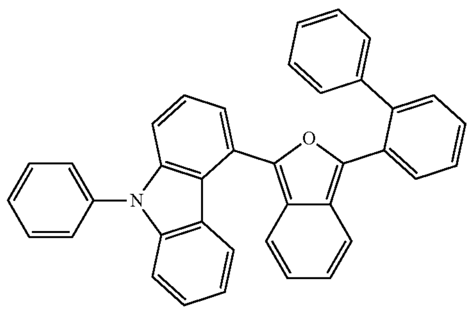
-continued
138
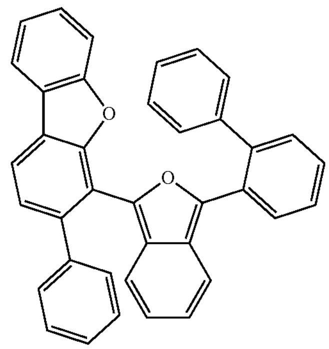
139
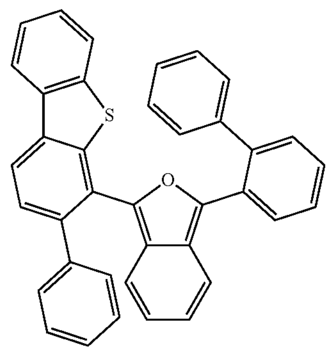
140
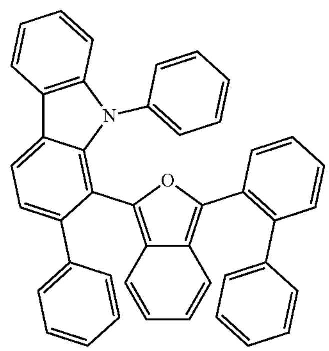
141
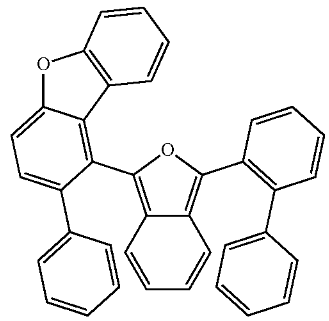

-continued
142
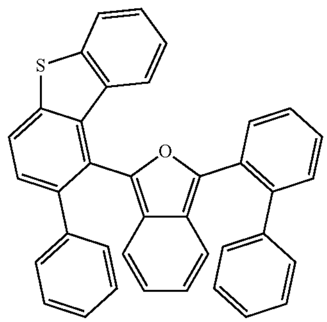
143
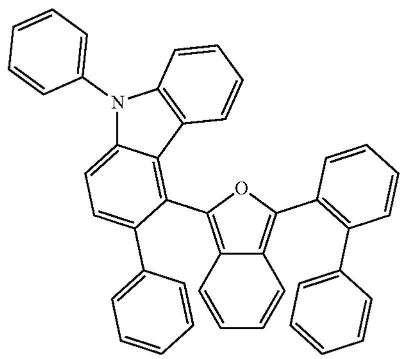
144
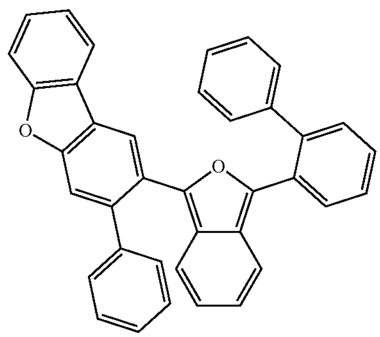
145
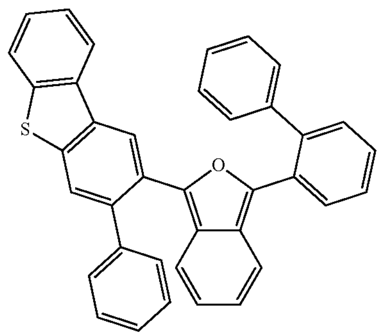
-continued
146
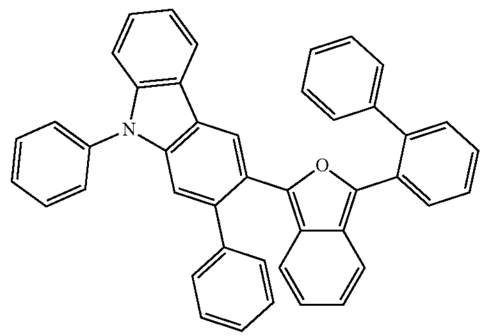
147
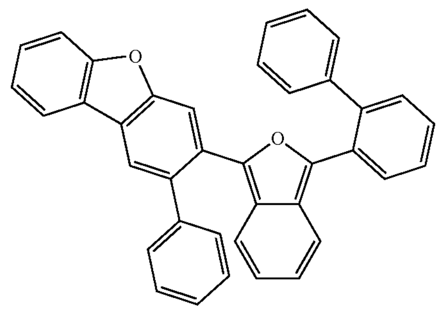
148
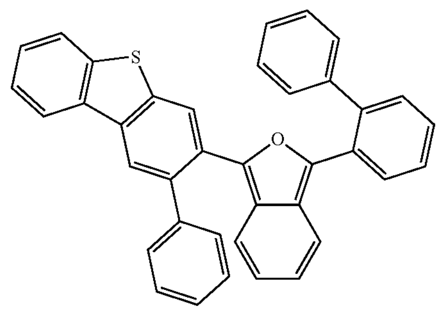
149
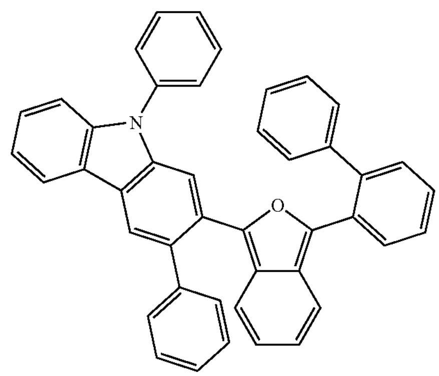
150
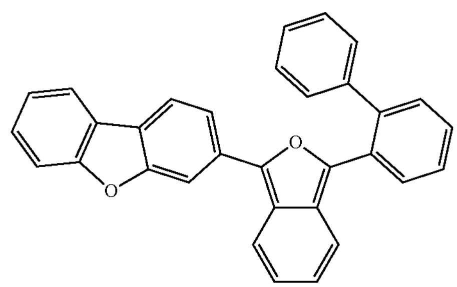

-continued
151
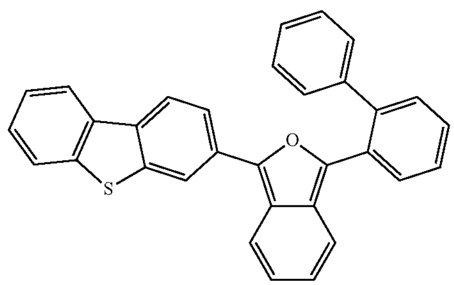
152
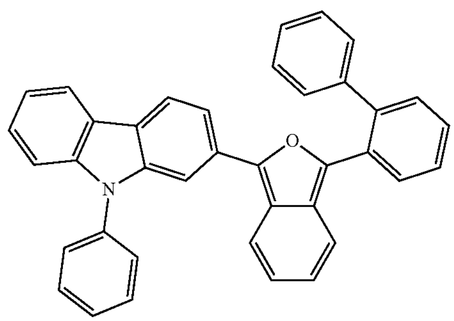
153
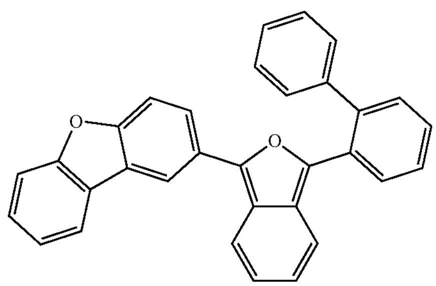
154
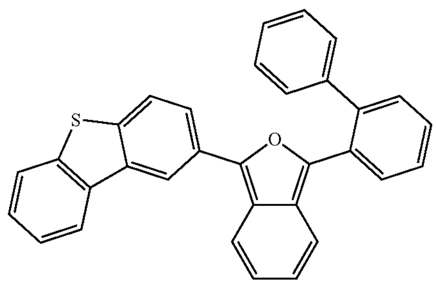
155
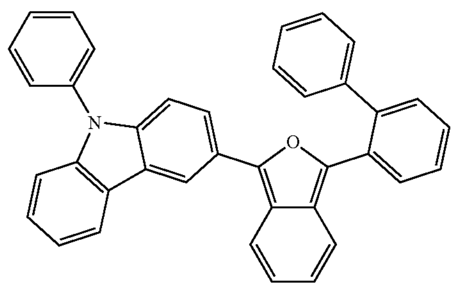
-continued
156
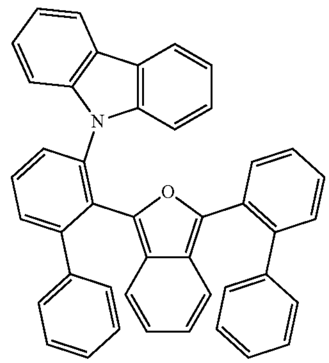
157
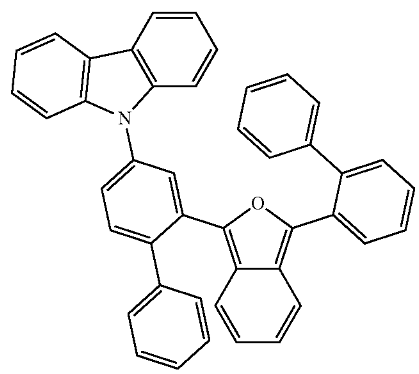
158
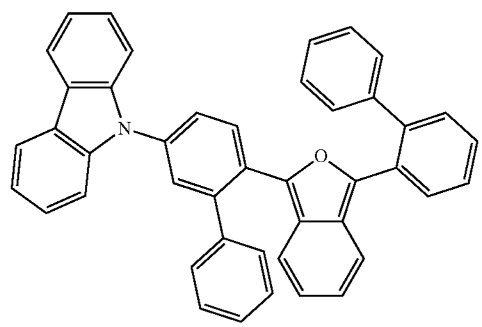
159
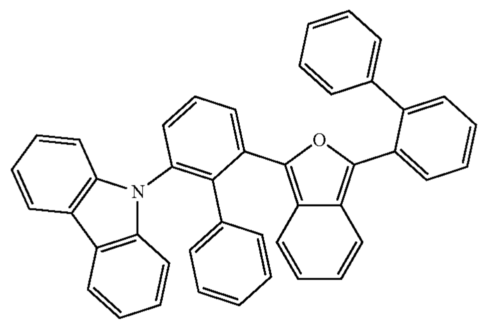

-continued
160
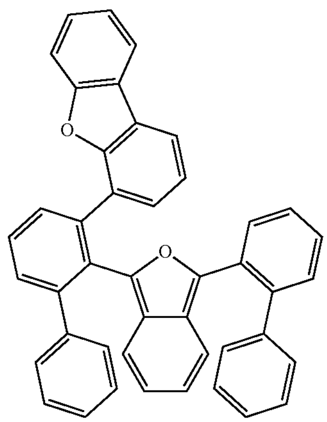
161
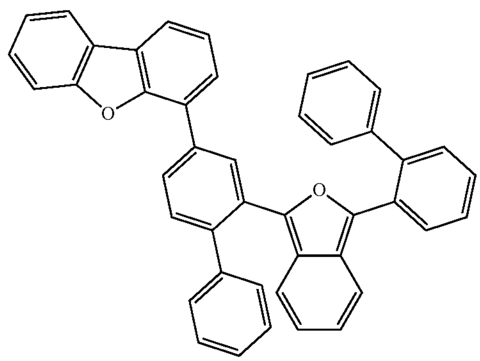
162
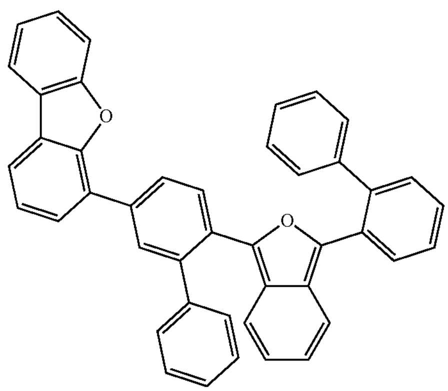
163
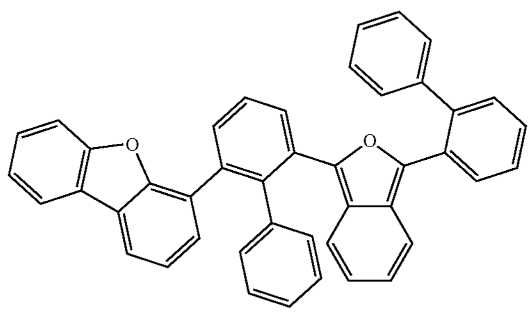
-continued
164
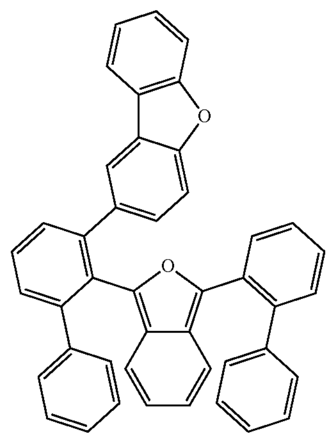
165
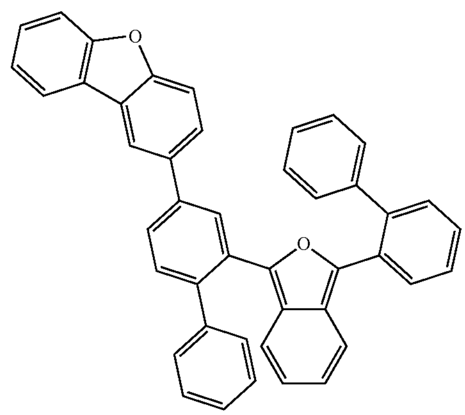
166
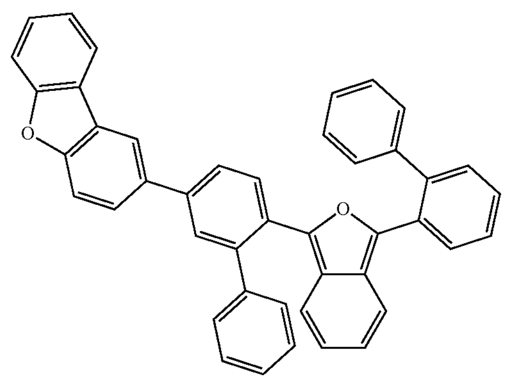
167
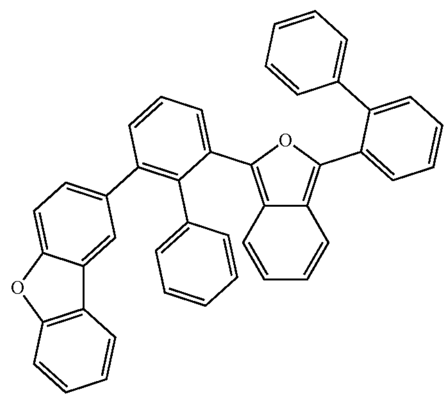

168
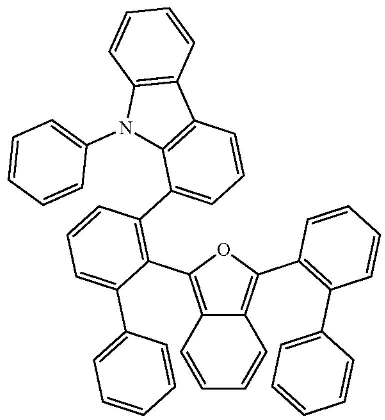
169
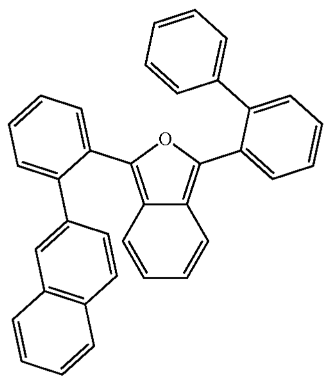
170
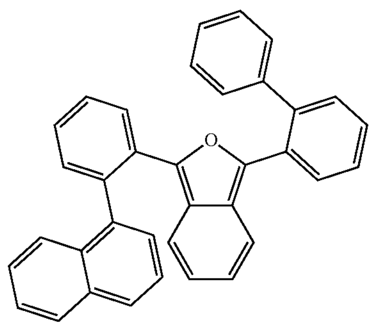
171
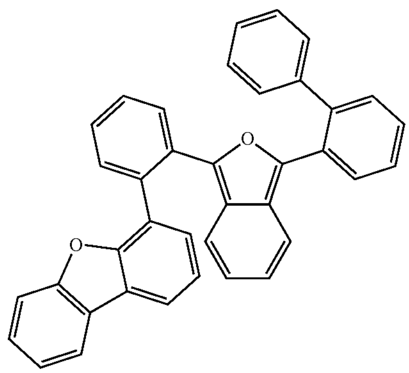
172
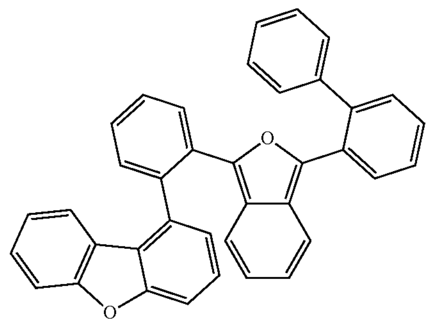
173
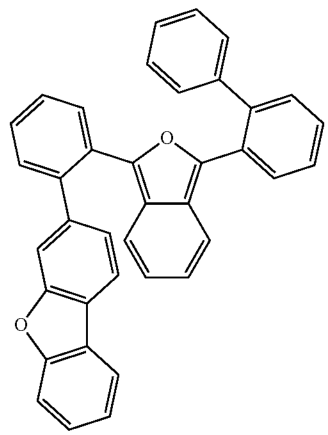
174
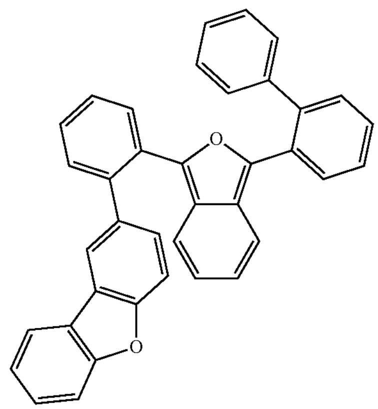
175
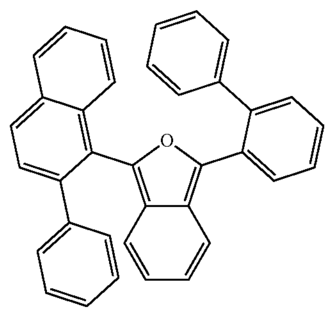

-continued
176
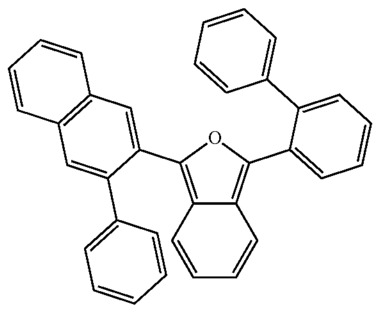
177
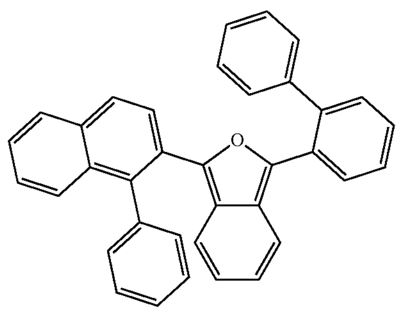
178
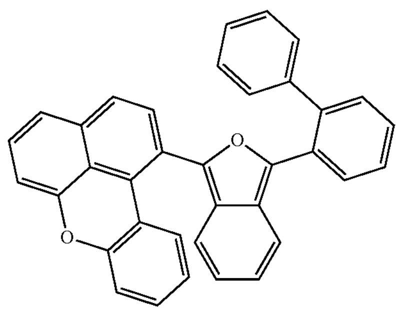
179
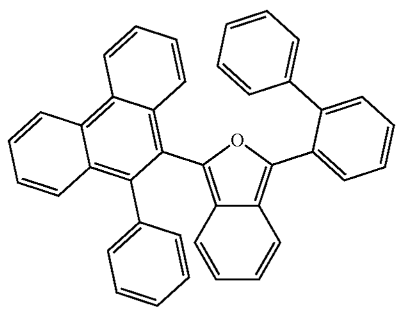
180
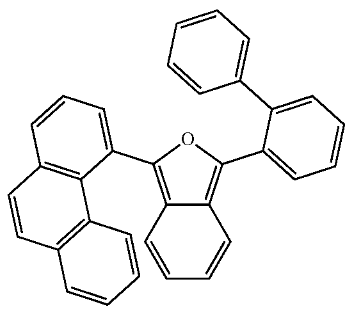
-continued
181
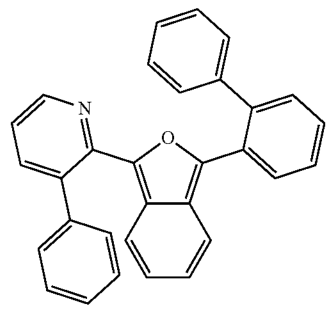
182
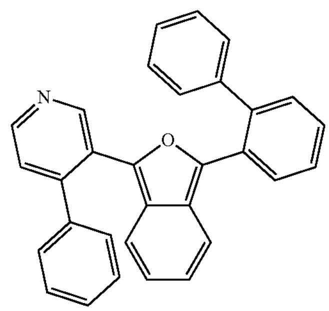
183
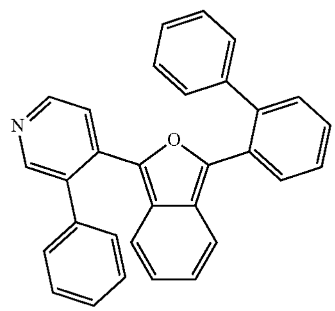
184
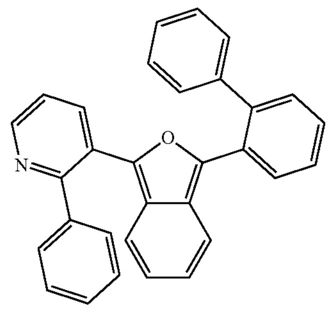
185
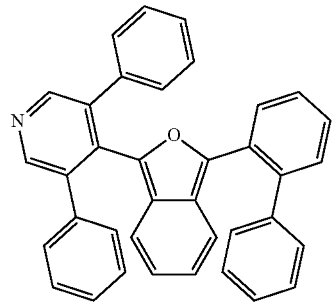

-continued
186
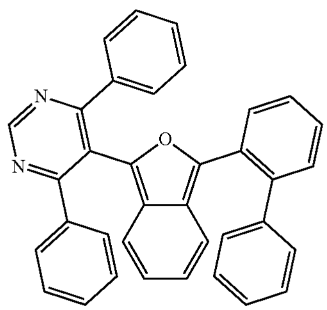
187
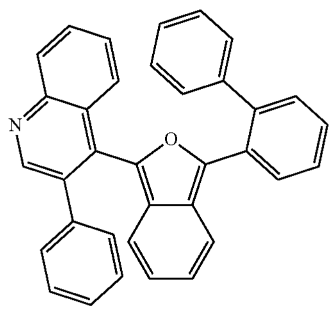
188
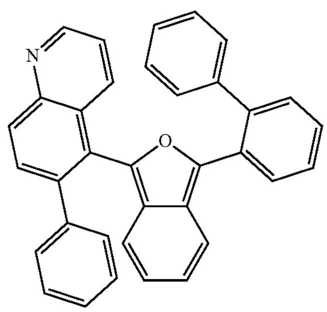
189
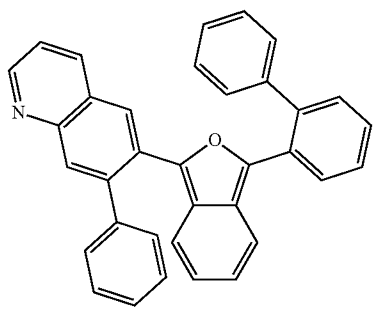
190
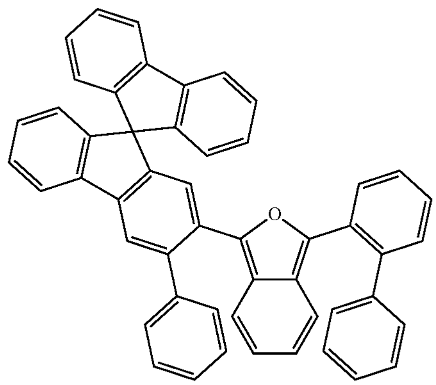
-continued
191
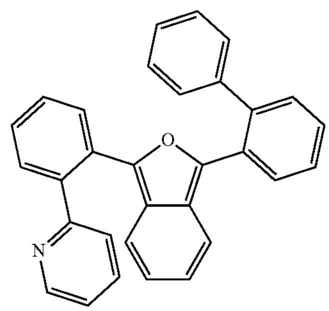
192
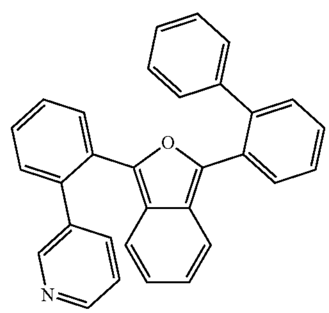
193
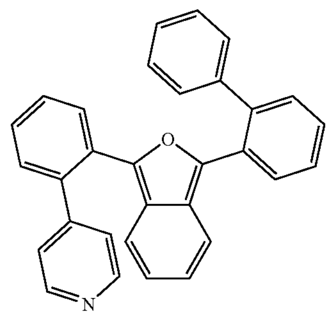
194
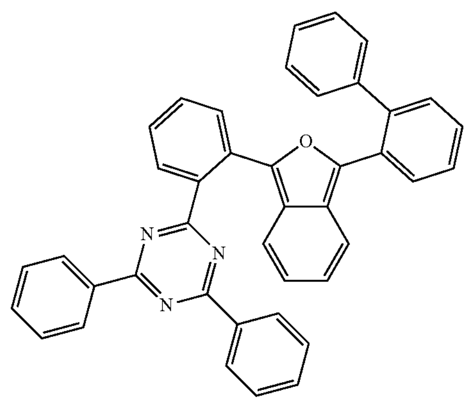

-continued
195
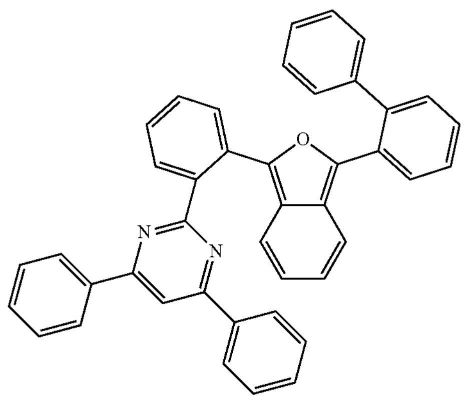
196
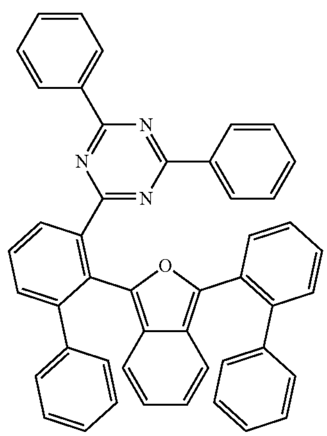
197
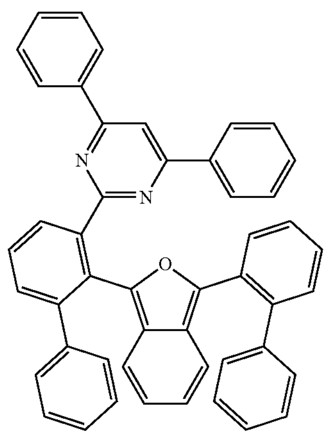
-continued
198
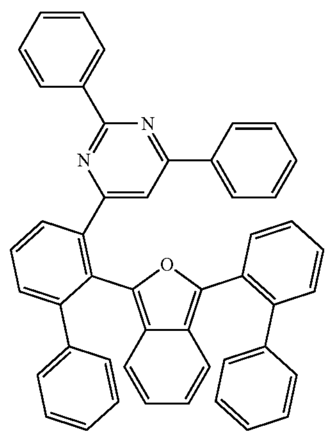
199
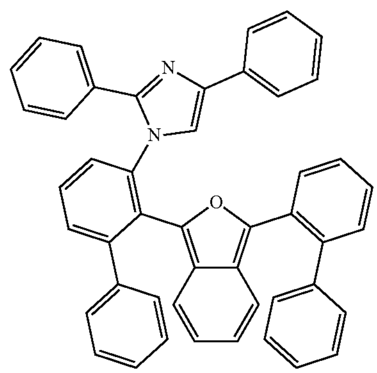
200
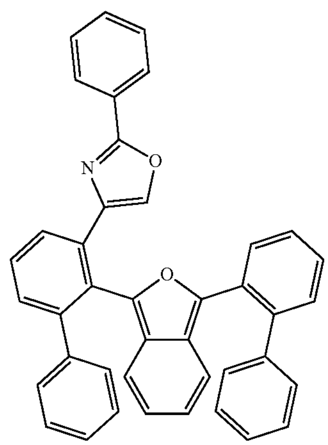
201
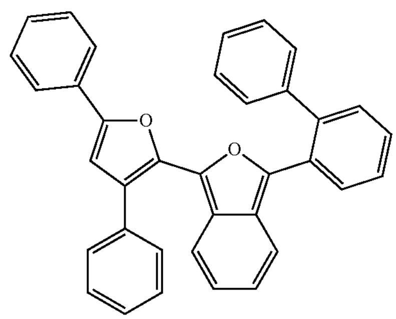

-continued
202
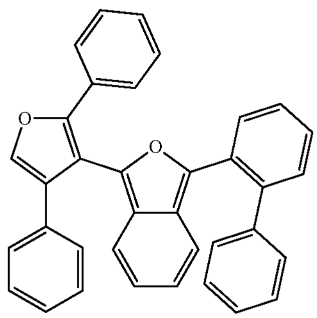
203
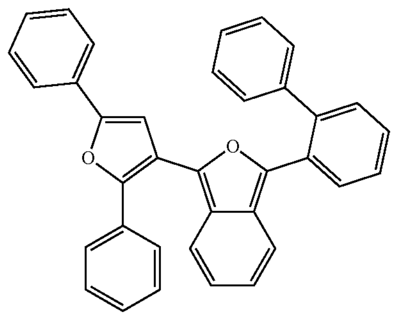
204
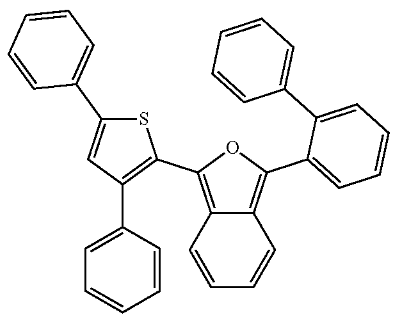
205
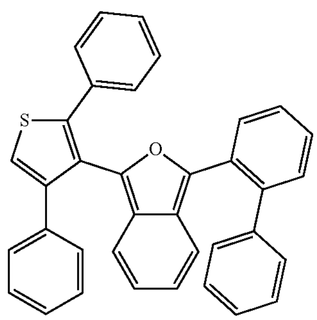
206
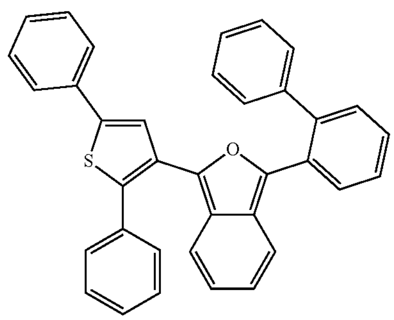
-continued
207
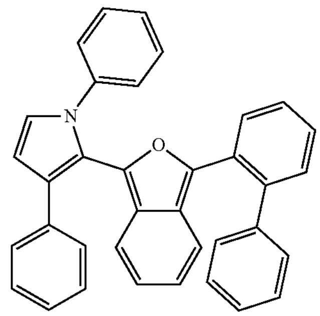
208
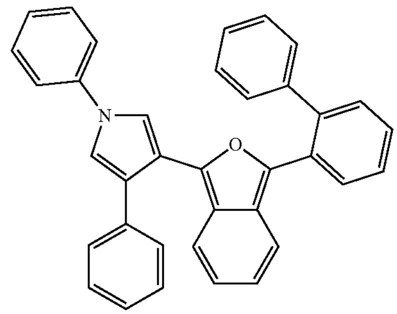
209
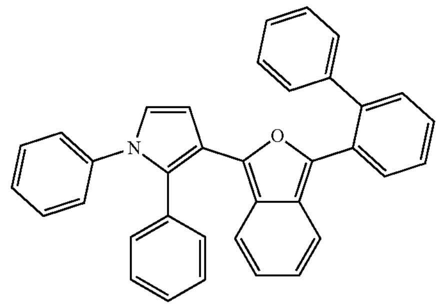
210
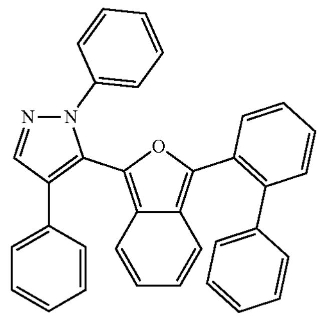
211
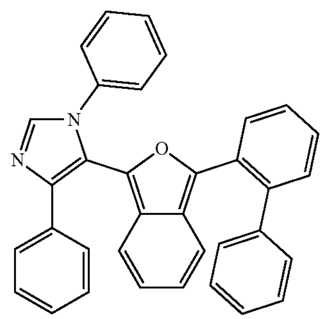

-continued
212
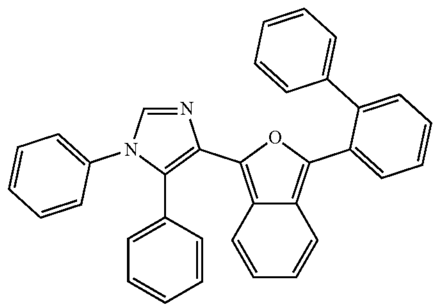
213
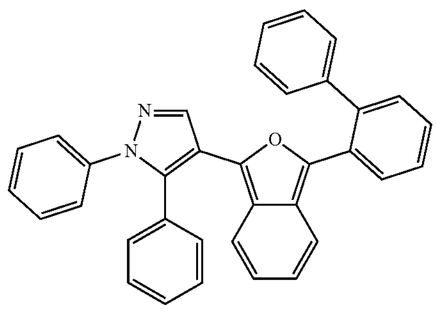
214
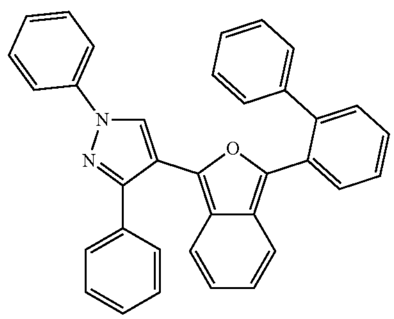
215
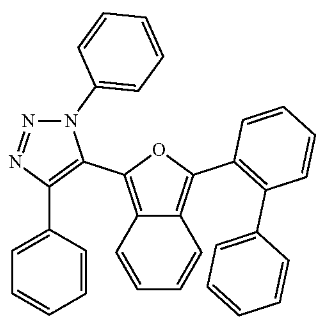
216
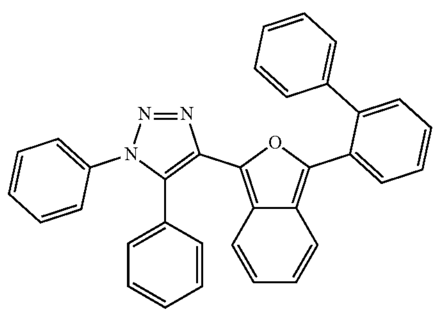
-continued
217
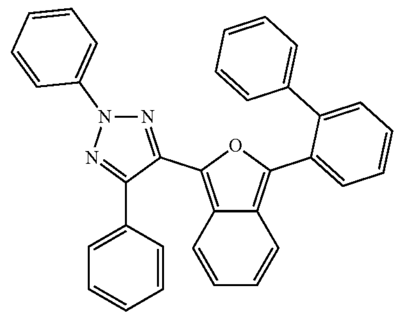
218
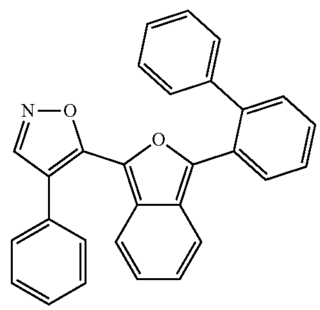
219
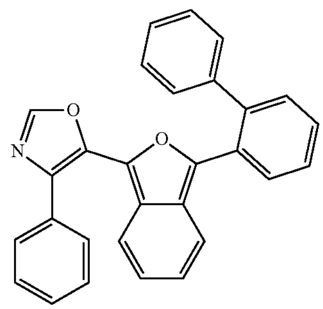
220
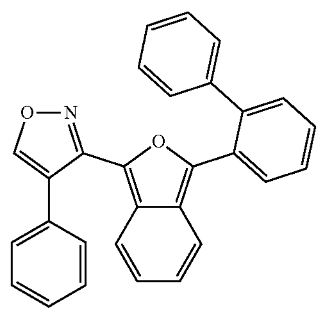
221
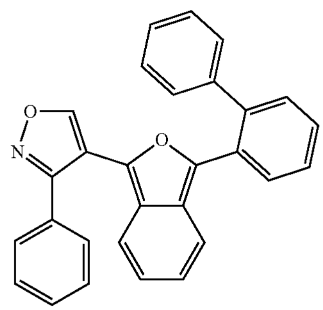

-continued
222
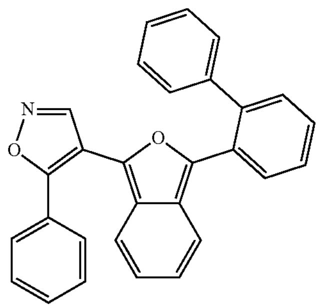
223
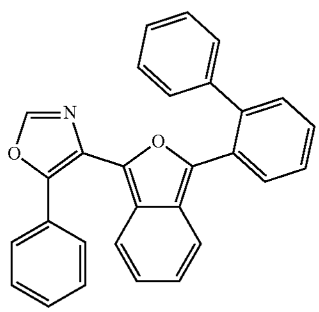
224
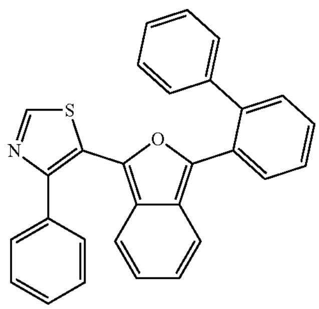
225
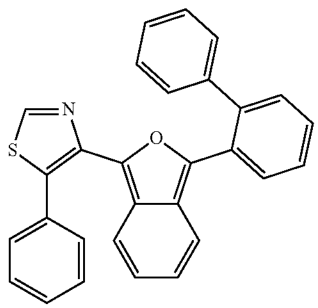
226
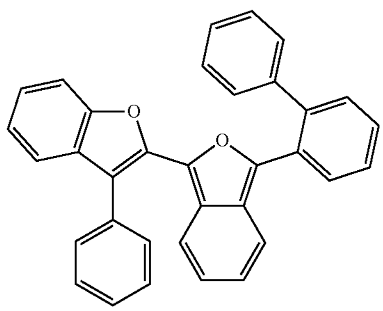
-continued
227
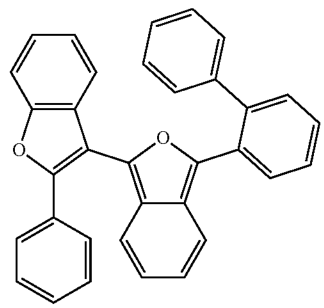
228
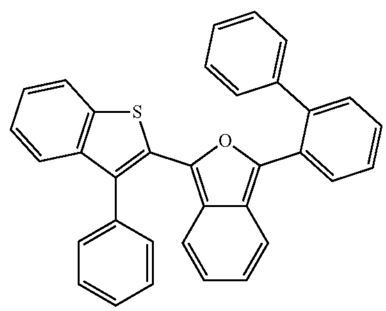
229
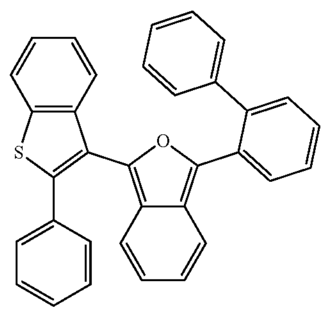
230
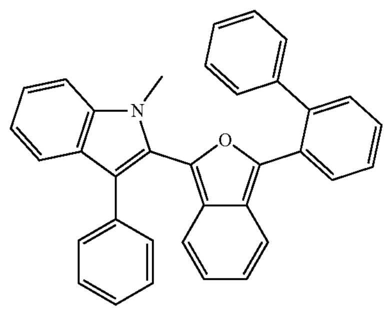
231
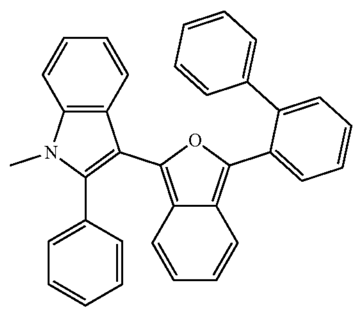

-continued
232
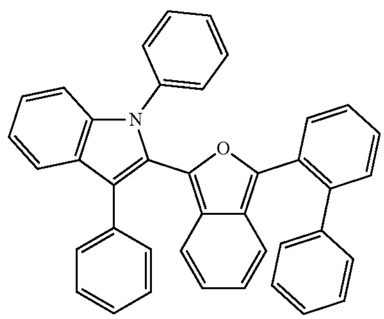
233
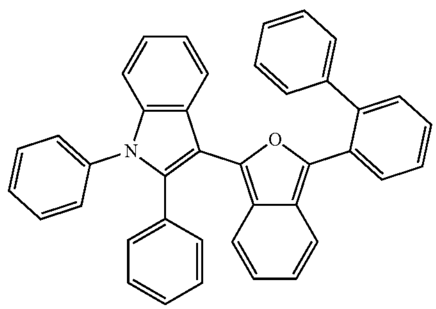
234
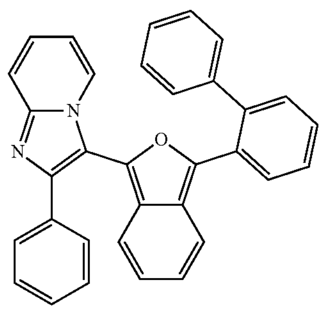
235
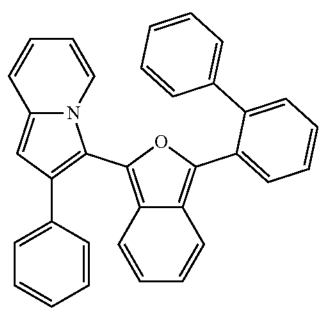
236
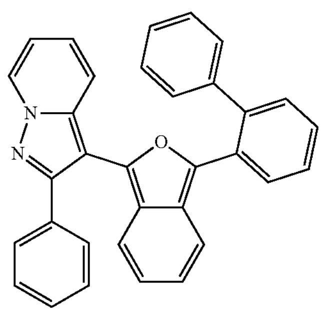
-continued
237
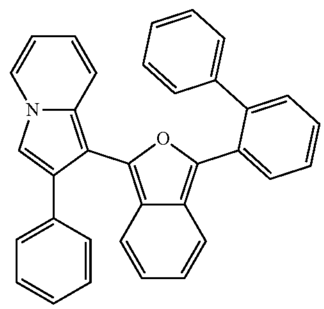
238
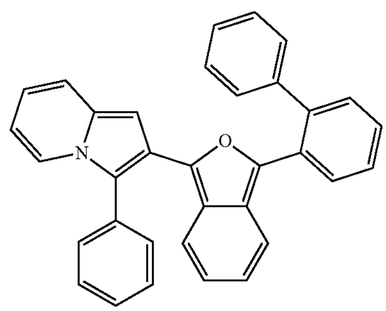
239
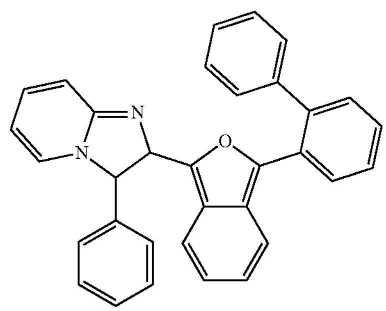
240
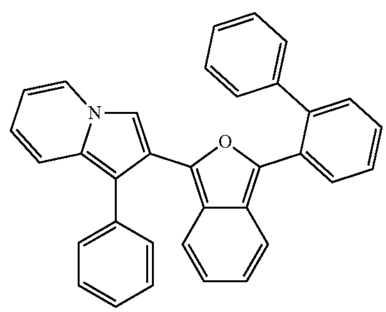
241
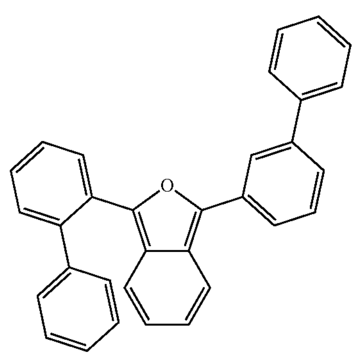

-continued
242
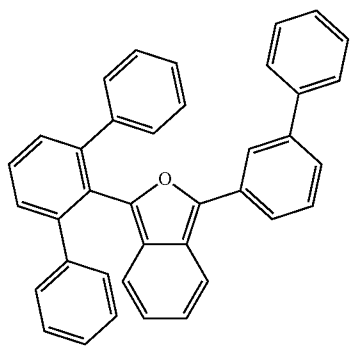
243
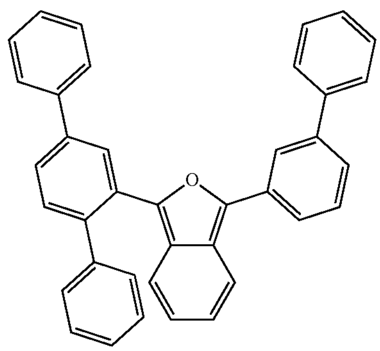
244
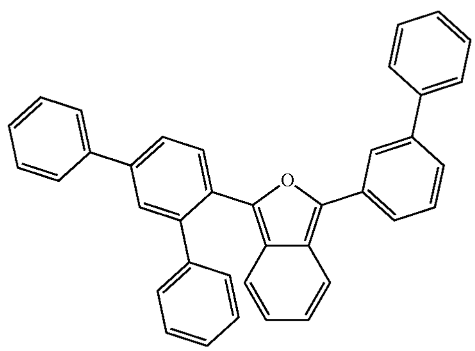
245
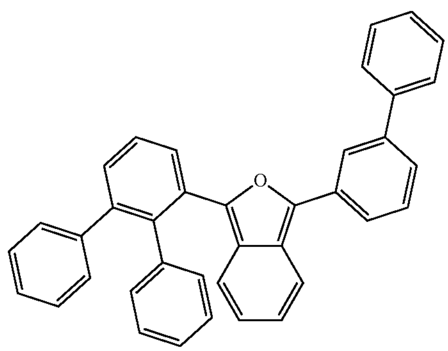
-continued
246
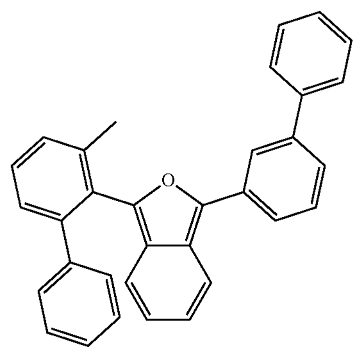
247
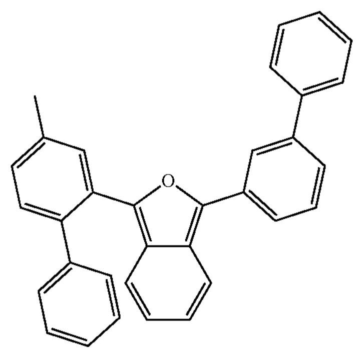
248
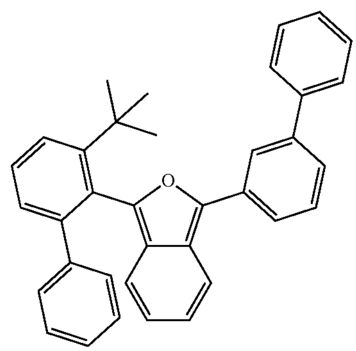
249
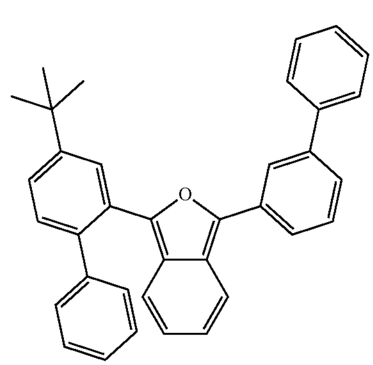

-continued
250
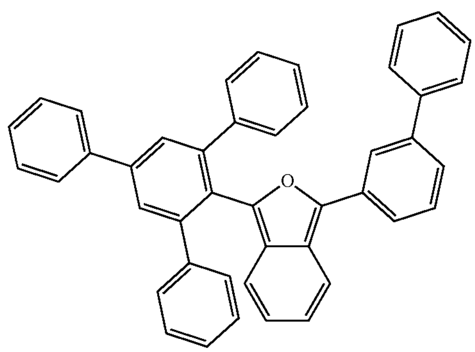
251
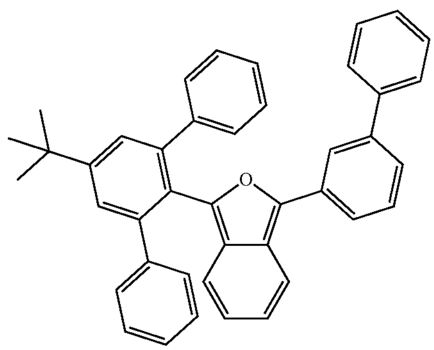
252
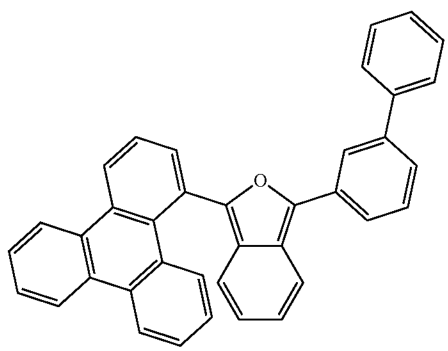
253
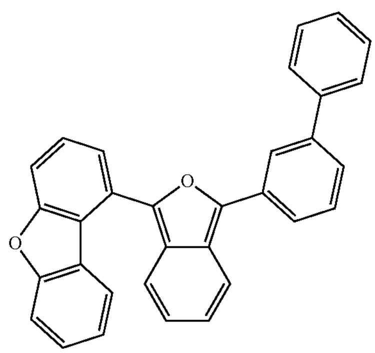
-continued
254
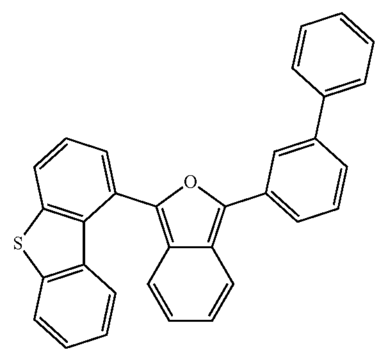
255
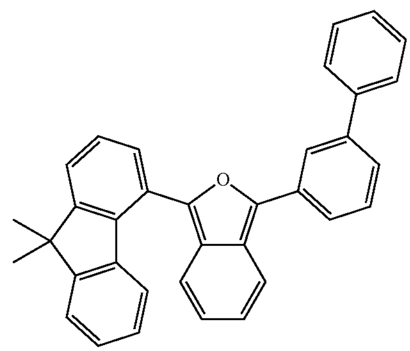
256
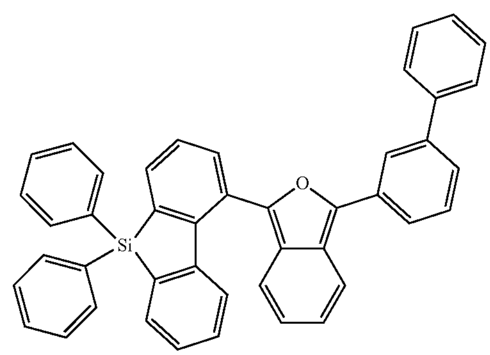
257
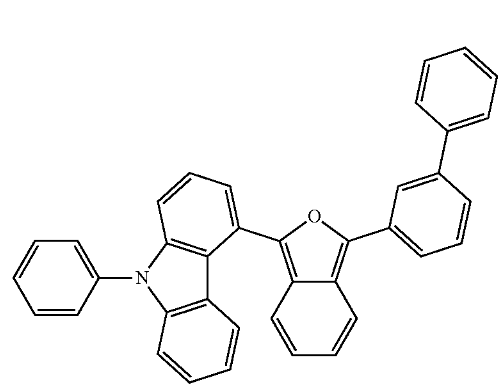

-continued
258
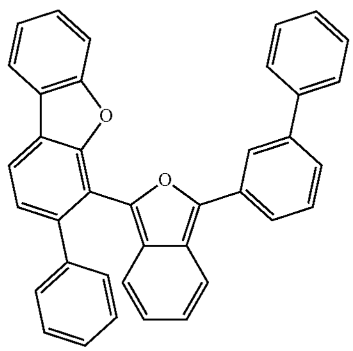
259
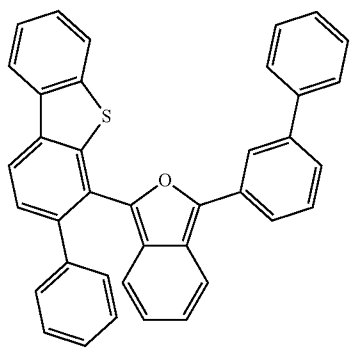
260
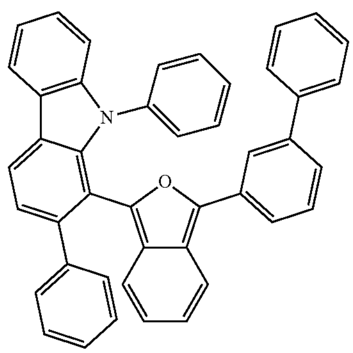
261
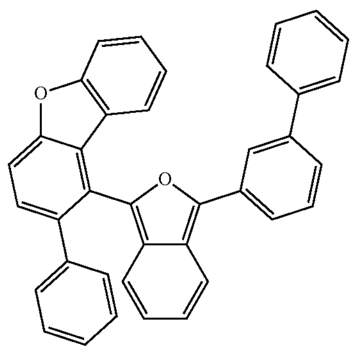
-continued
262
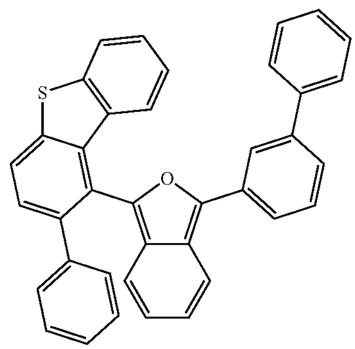
263
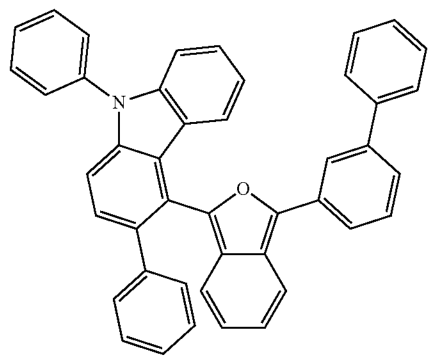
264
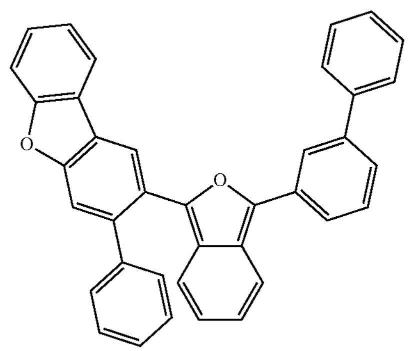
265
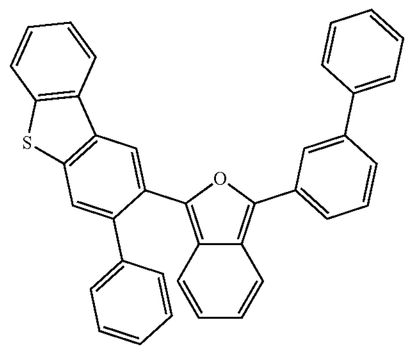

-continued
266
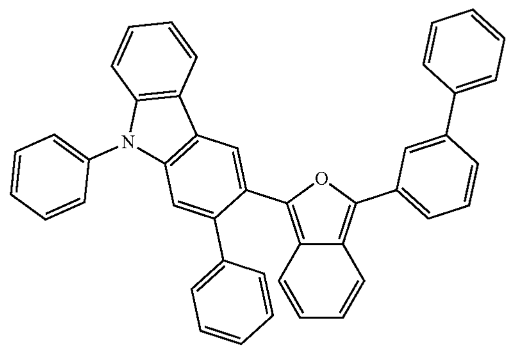
267
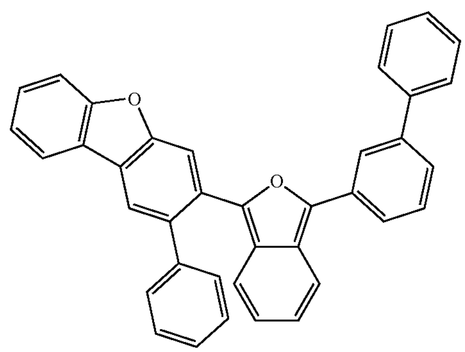
268
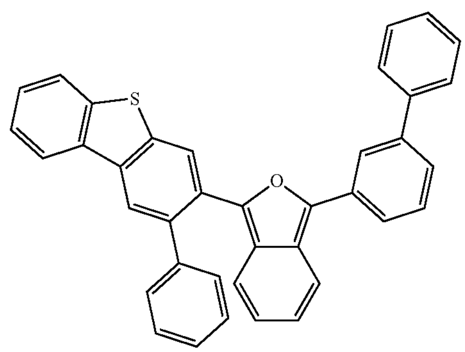
269
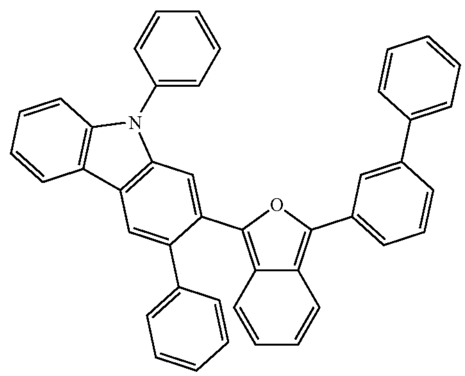
-continued
270
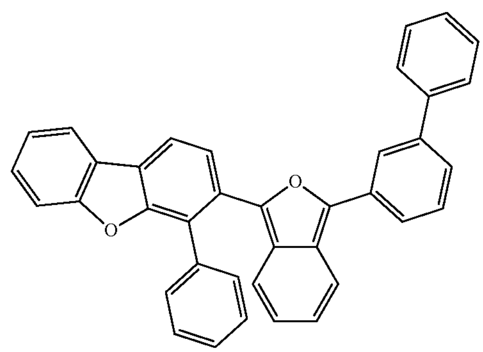
271
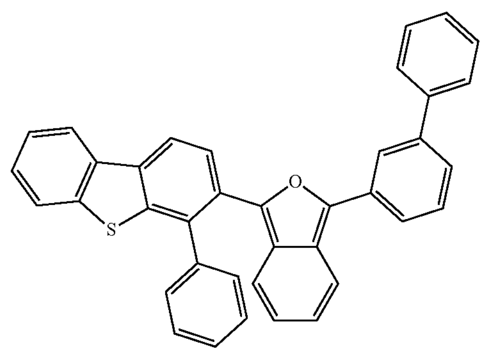
272
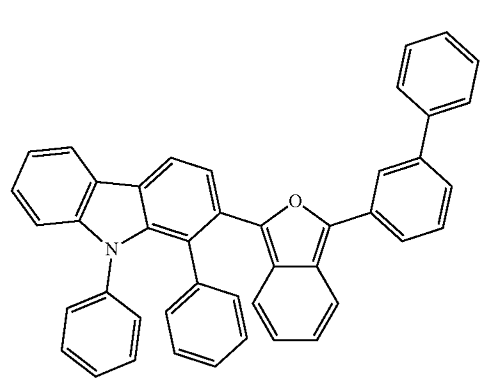
273
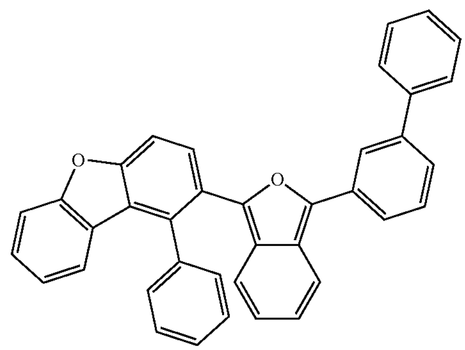

-continued
274
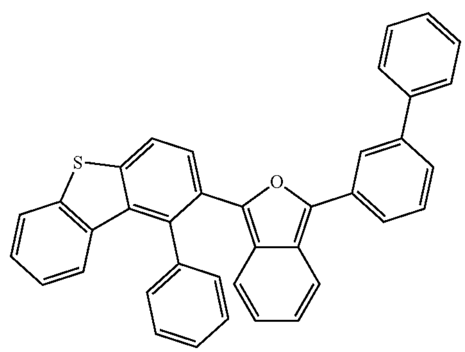
275
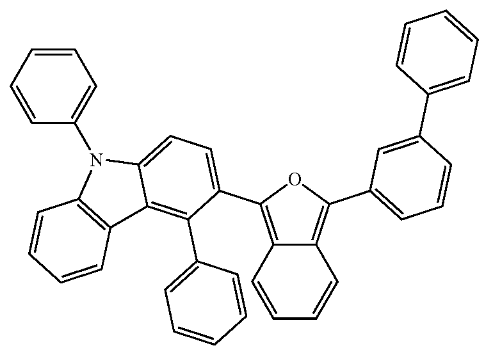
276
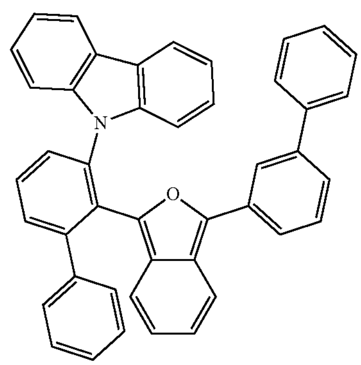
277
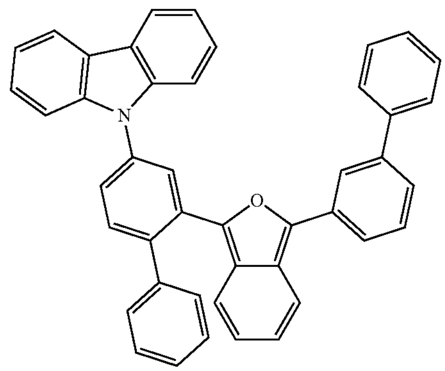
-continued
278
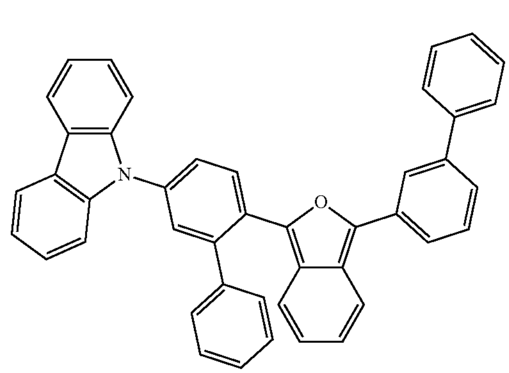
279
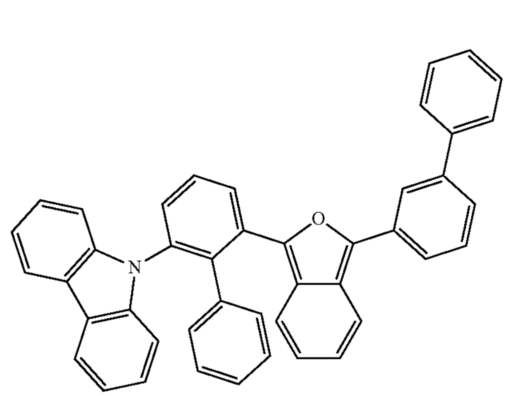
280
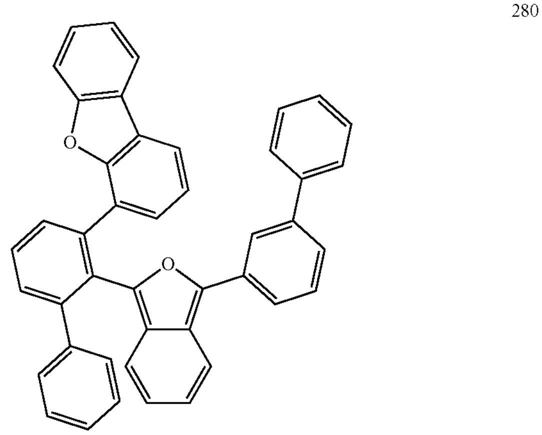 [SMILES: c1ccc(-c2cccc(-c3oc(-c4c(-c5ccccc5)cccc4-c4cccc5c4oc4ccccc45)c4ccccc34)c2)cc1]
281
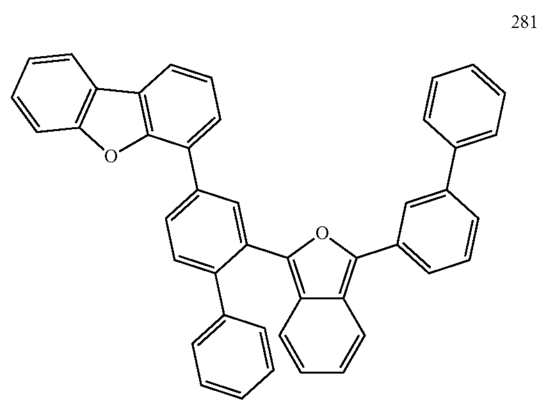

-continued
282
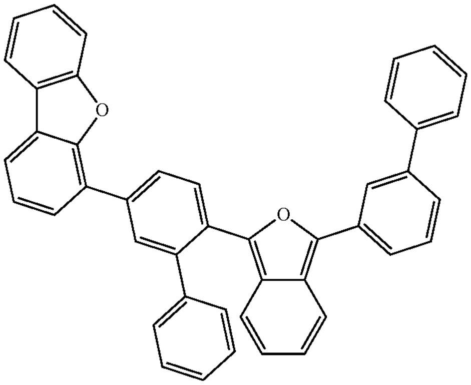
283
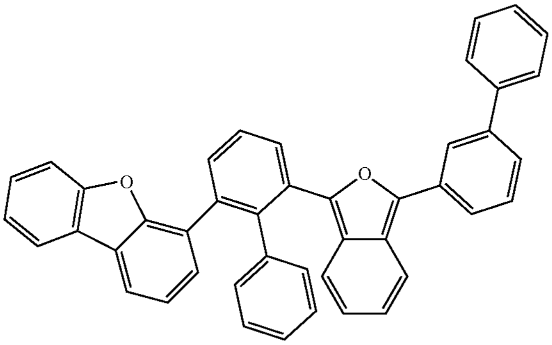
284
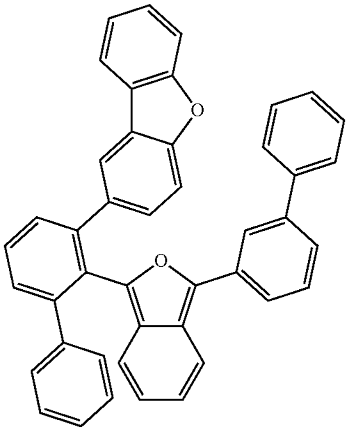
285
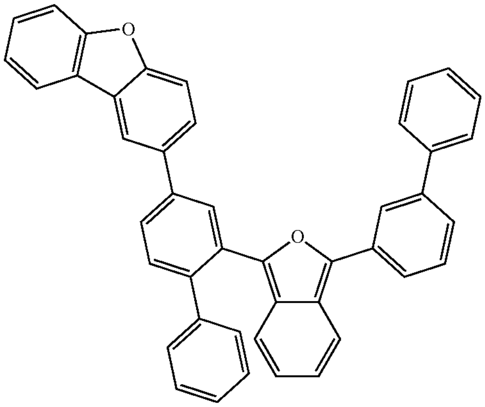
-continued
286
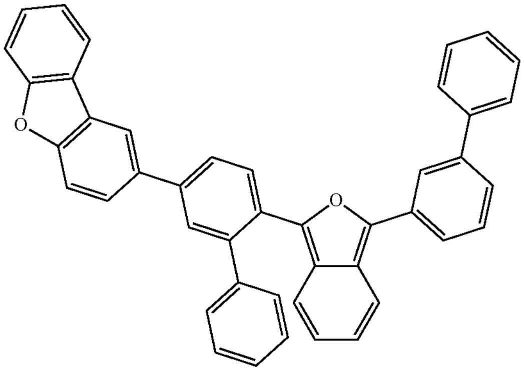
287
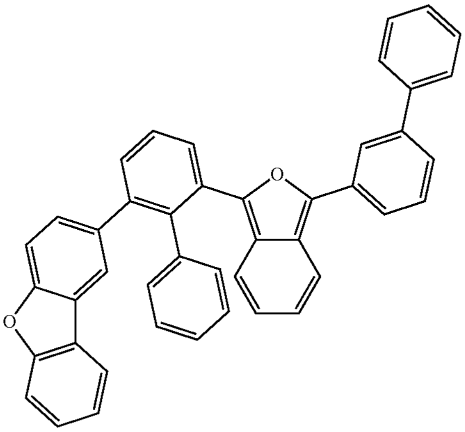
288
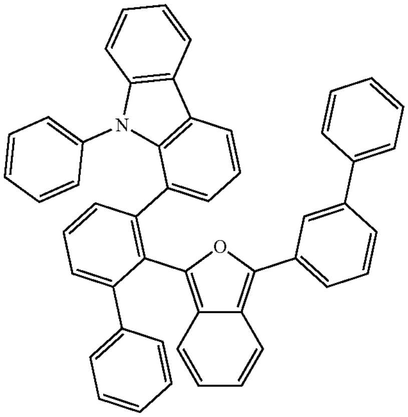

-continued
289
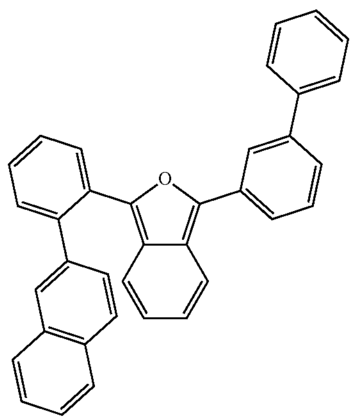
290
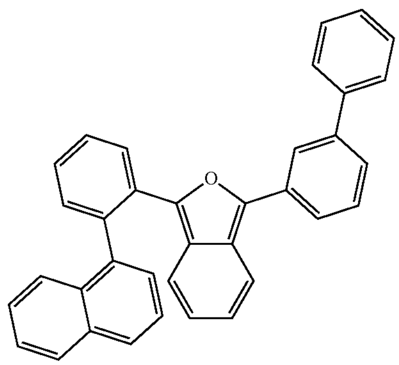
291
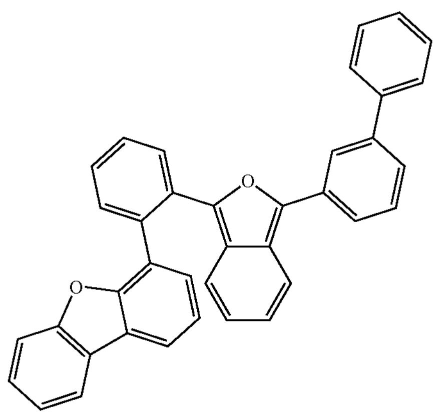
292
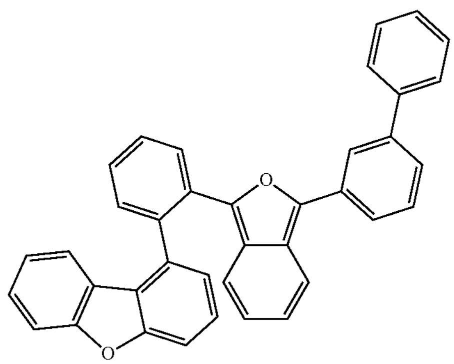
-continued
293
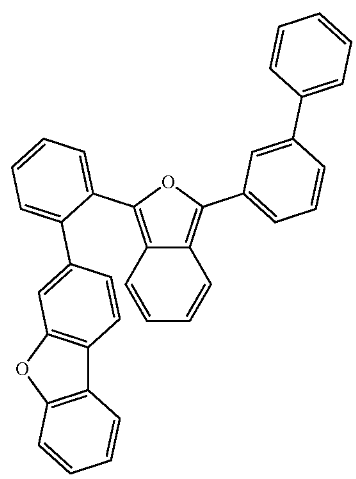
294
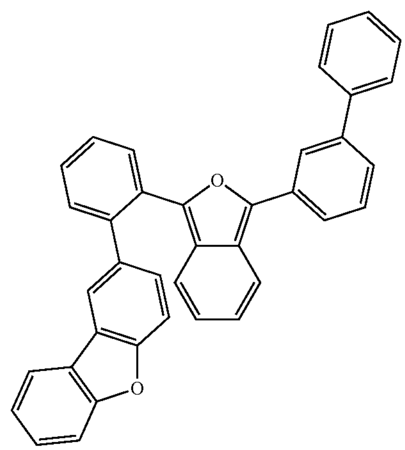
295
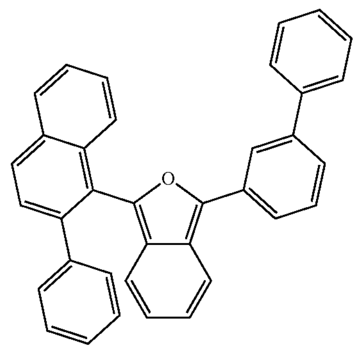
296
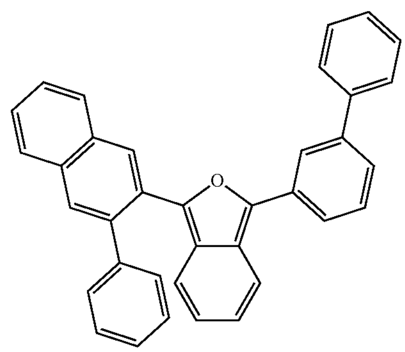

-continued
297
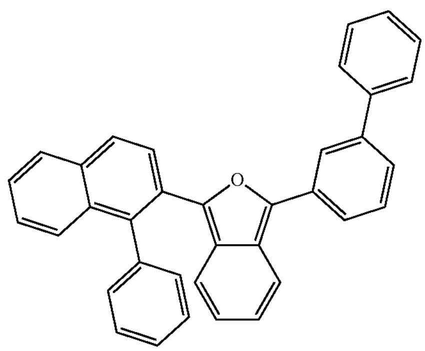
298
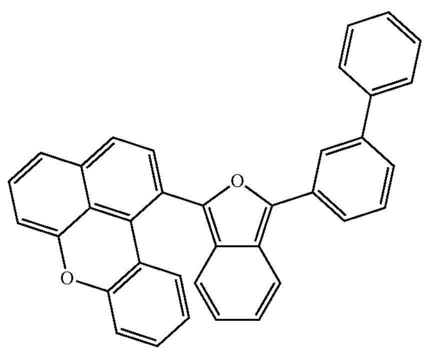
299
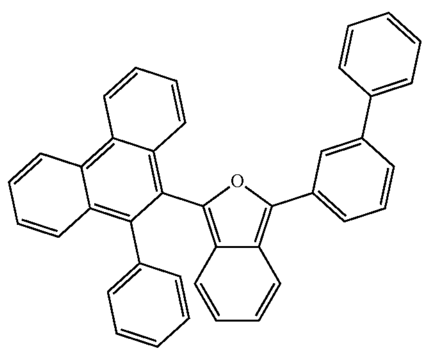
300
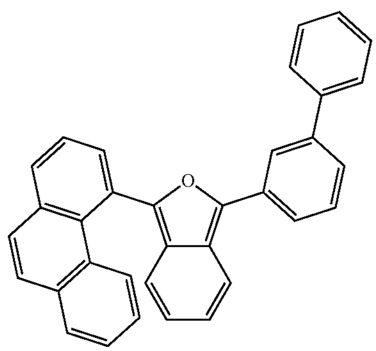
-continued
301
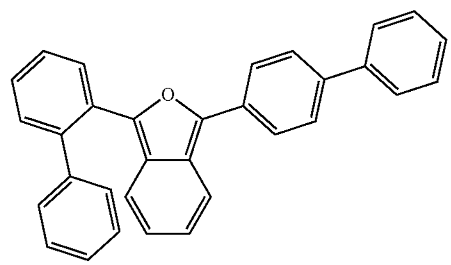
302
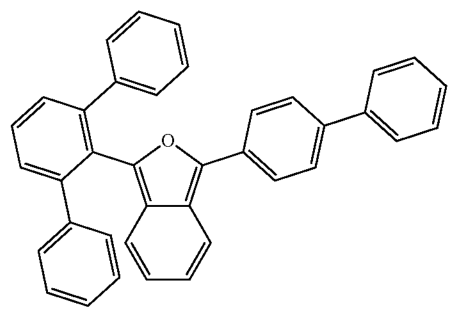
303
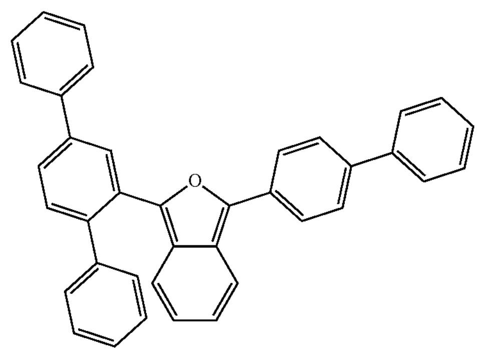
304
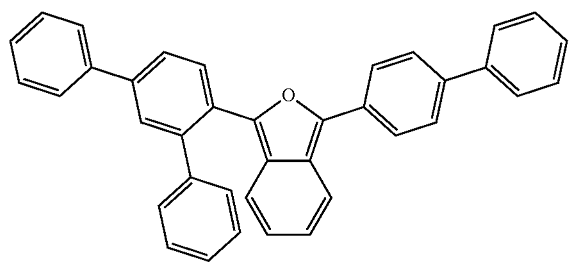
305
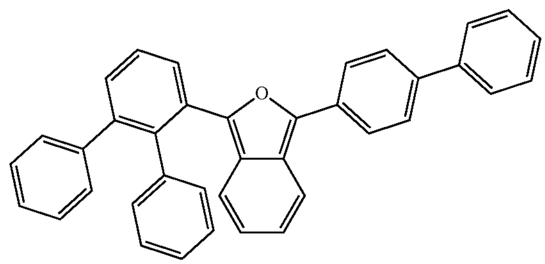

-continued
306
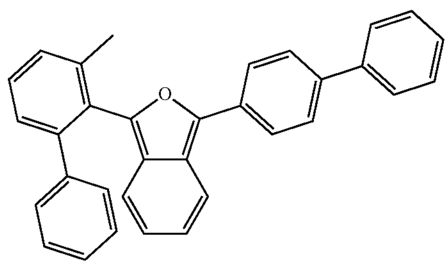
307
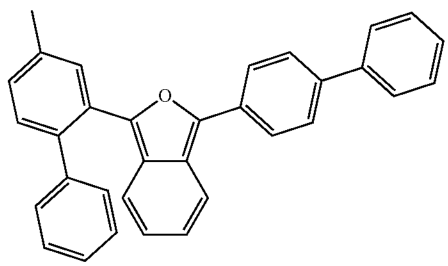
308
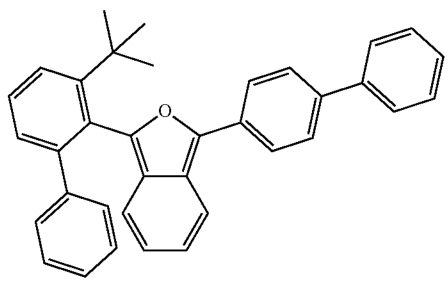
309
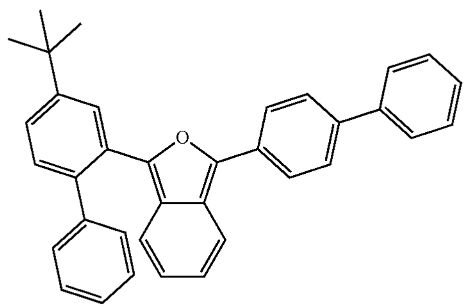
310
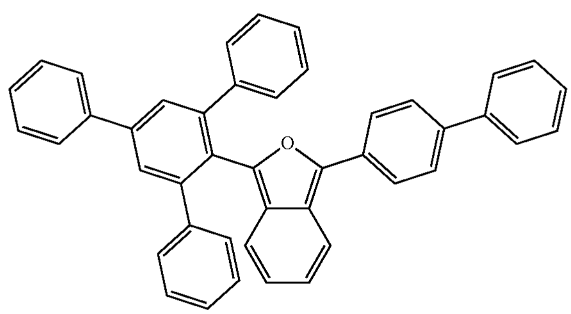
-continued
311
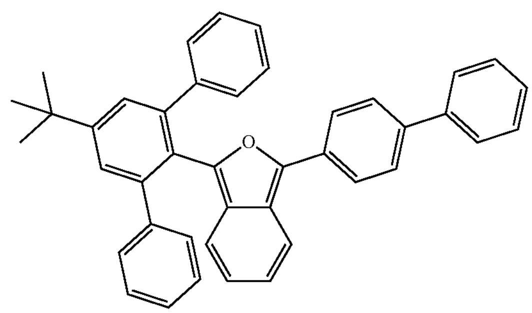
312
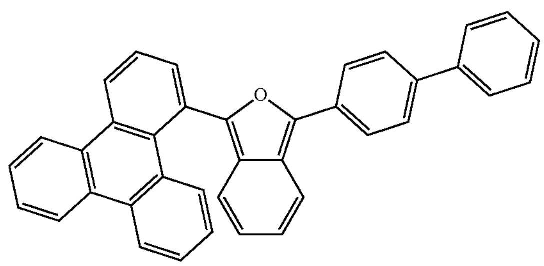
313
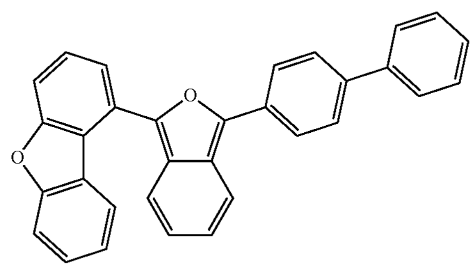
314
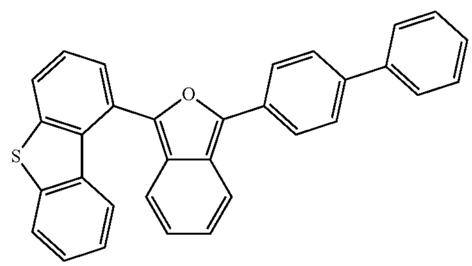
315
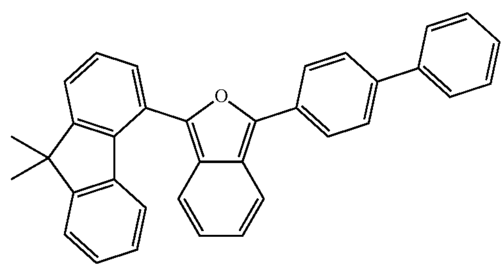

-continued
316
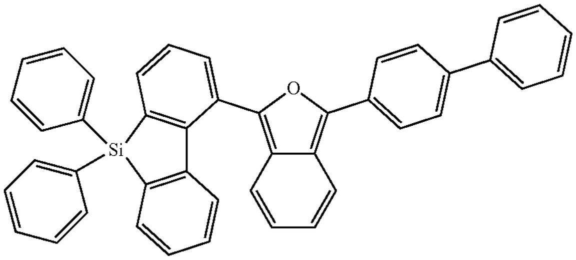
317
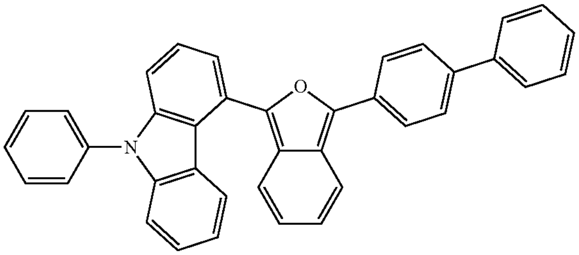
318
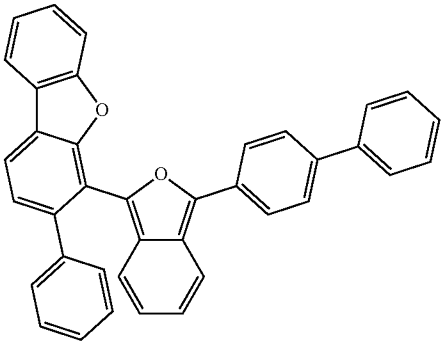
319
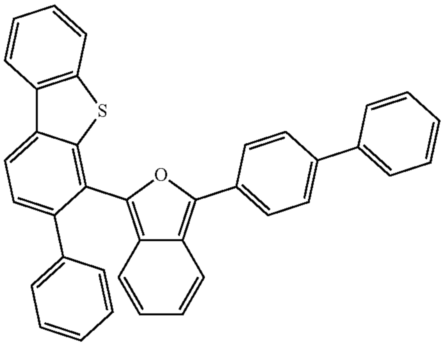
320
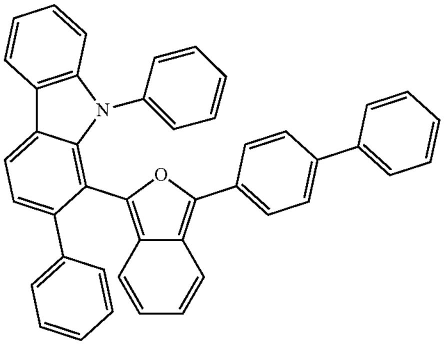
-continued
321
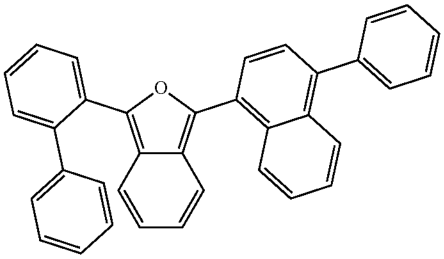
322
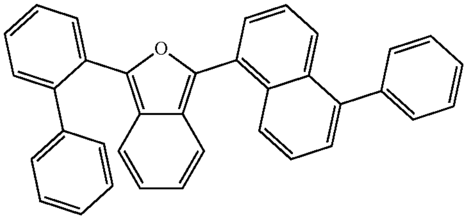
323
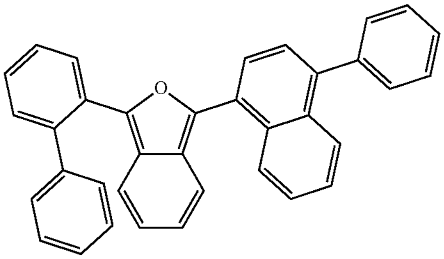
324
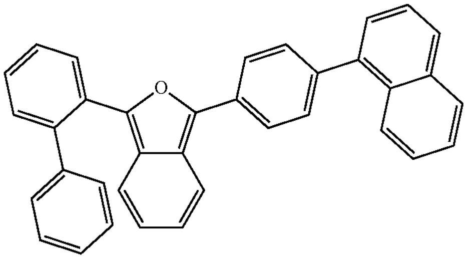
325
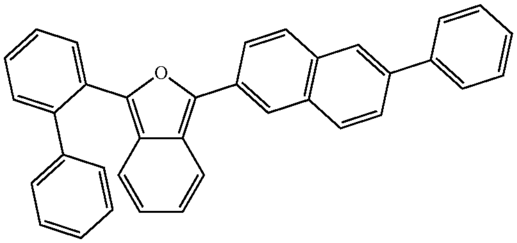
326
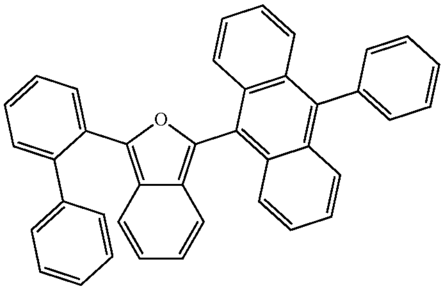

-continued
327
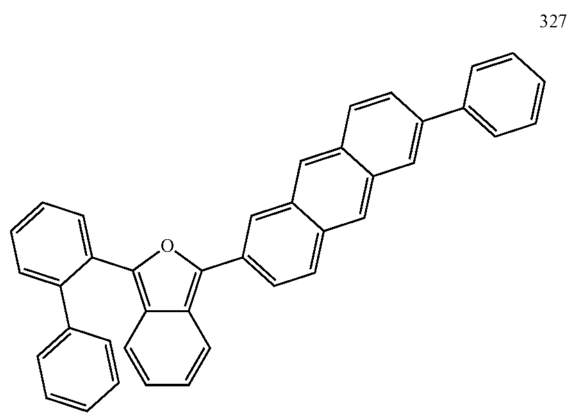
328
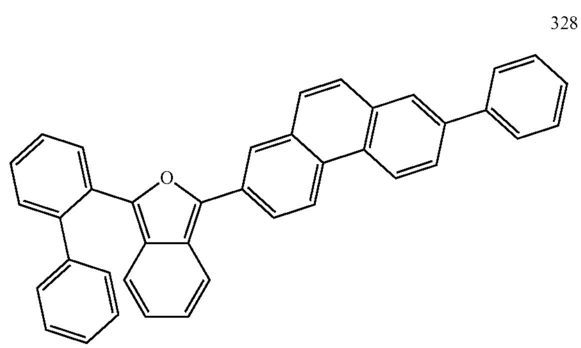
329
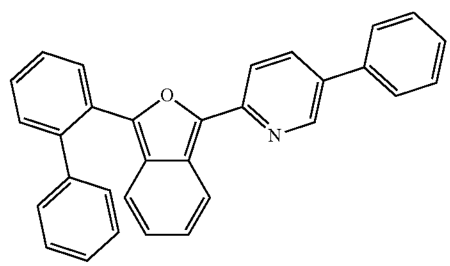
330
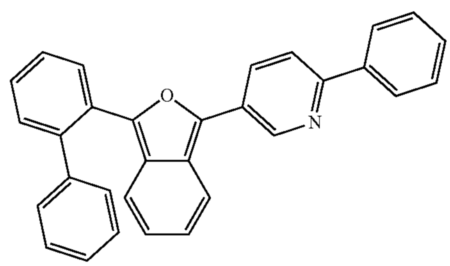
331
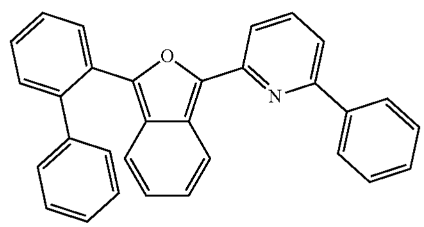
-continued
332
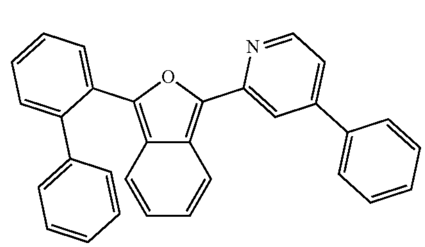
333
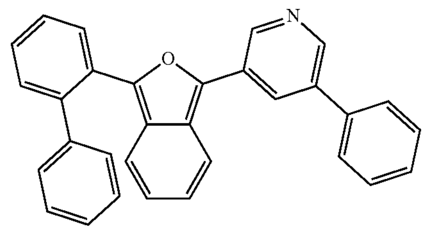
334
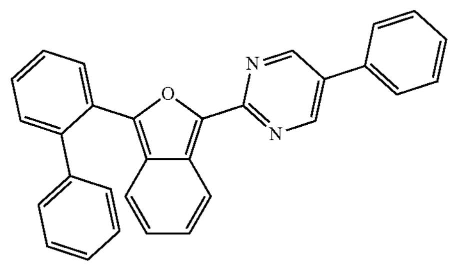
335
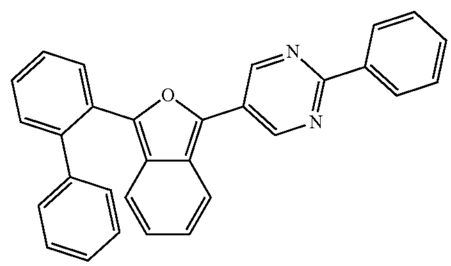
336
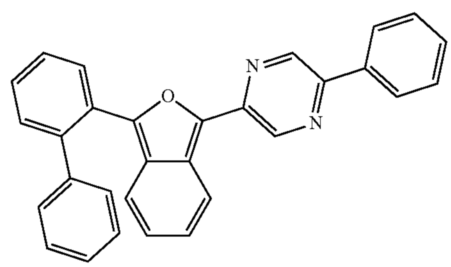
337
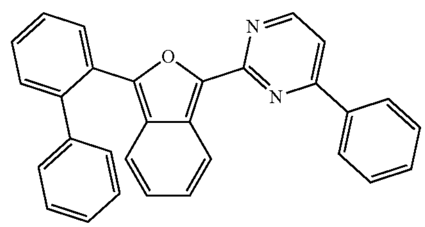

-continued
338
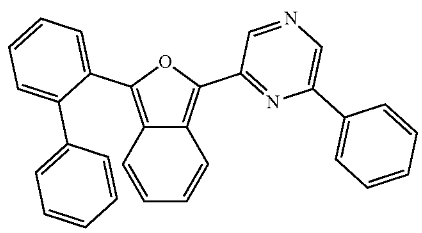
339
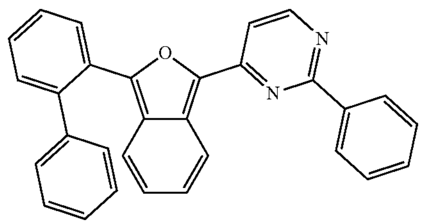
340
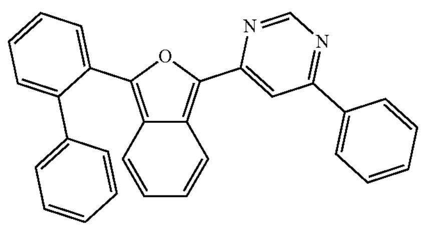
341
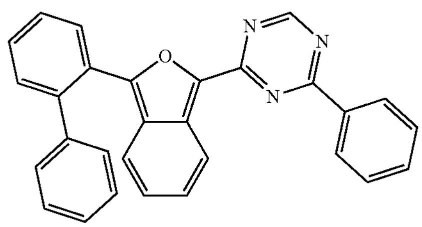
342
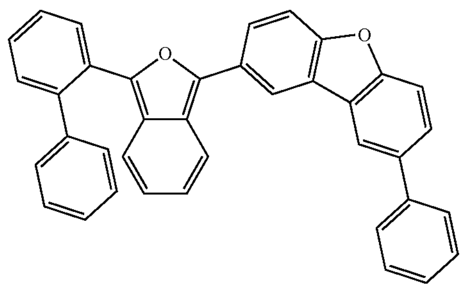
343
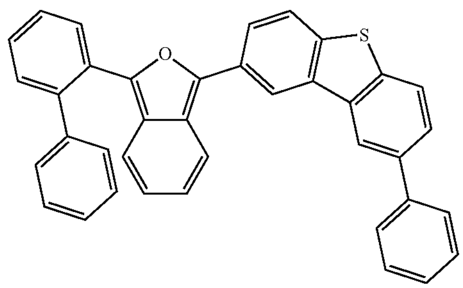
-continued
344
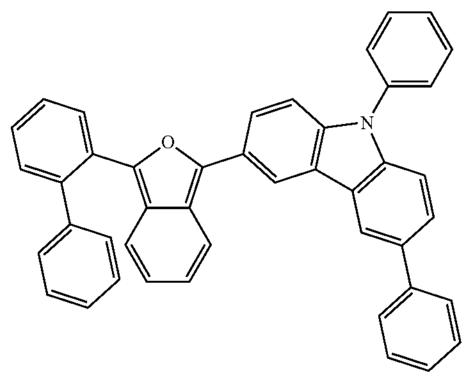
345
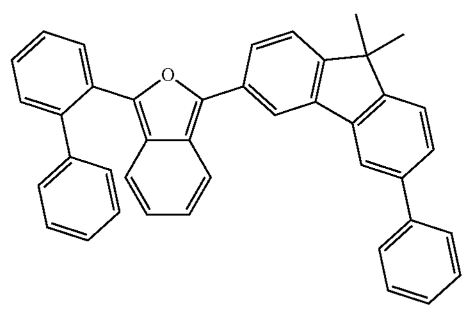
346
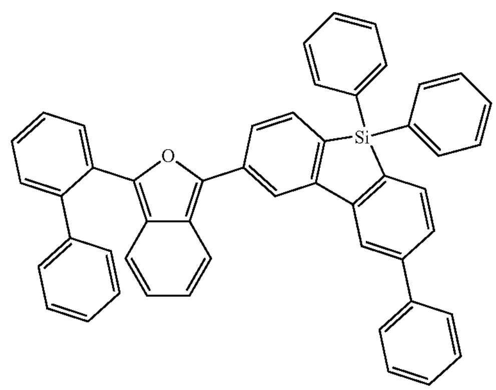
347
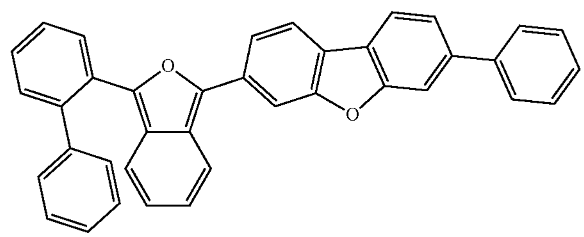
348
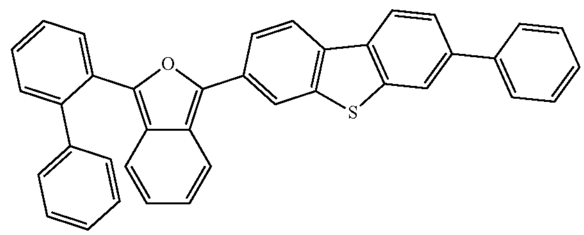

-continued
349
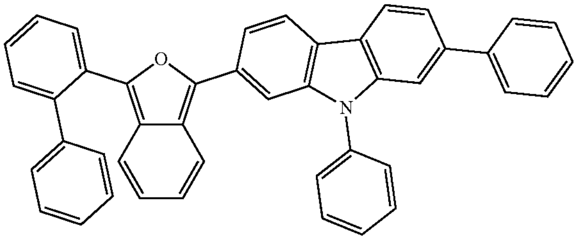
350
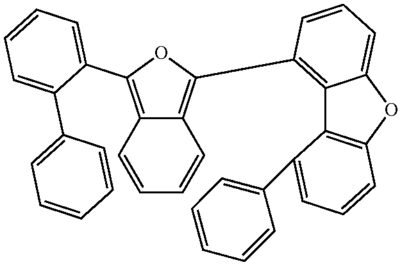
351
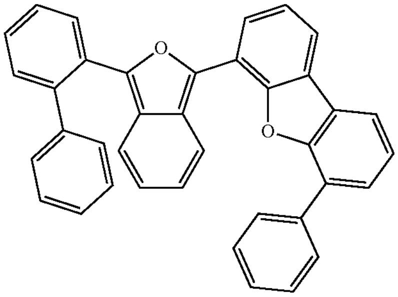
352
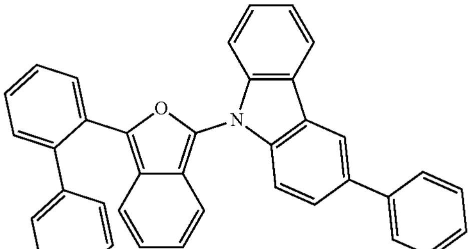
353
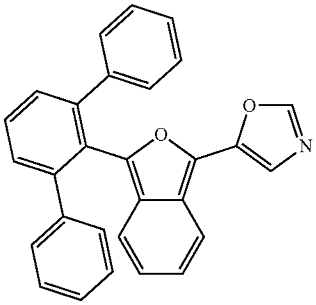
-continued
354
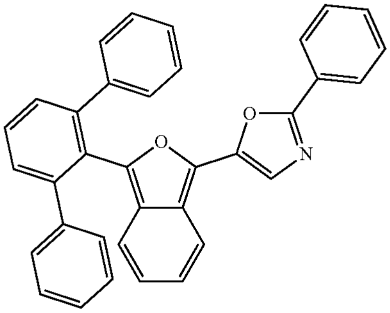
355
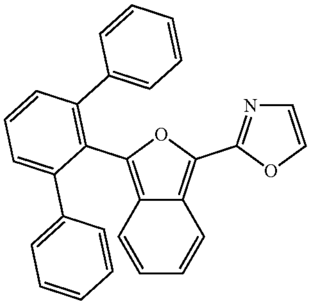
356
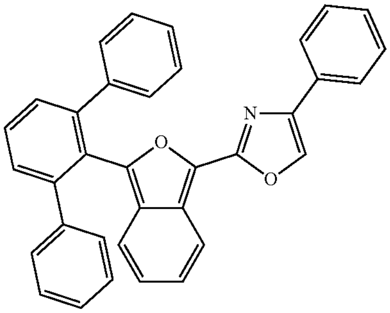
357
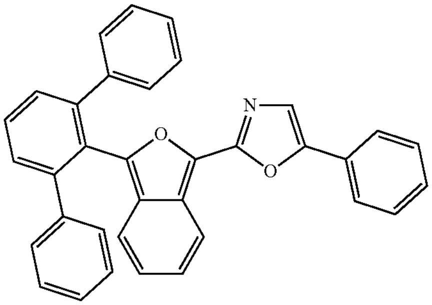
358
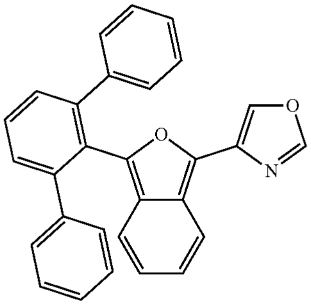

-continued
359
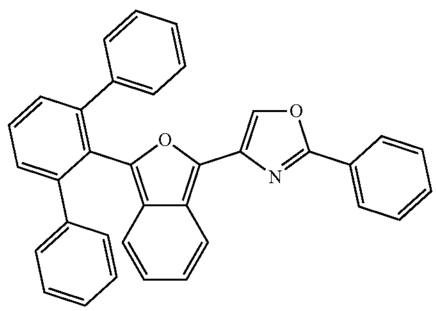
360
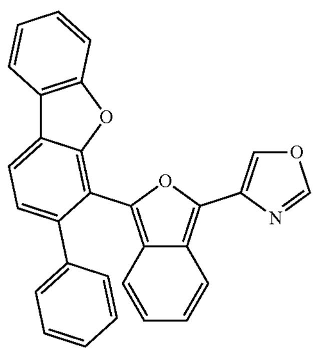
361
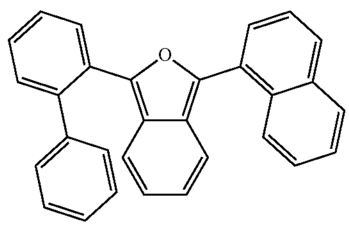
362
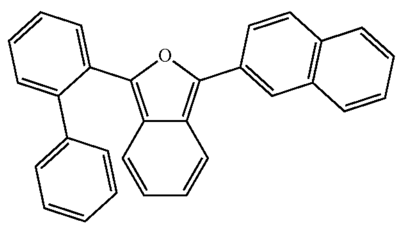
363
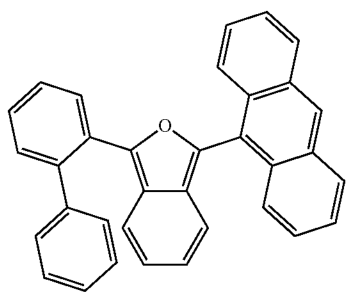
-continued
364
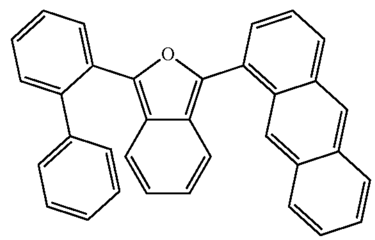
365
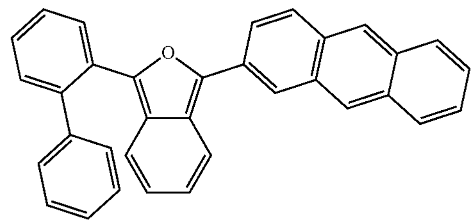
366
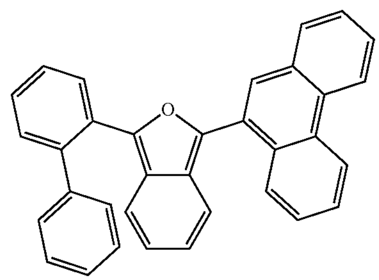
367
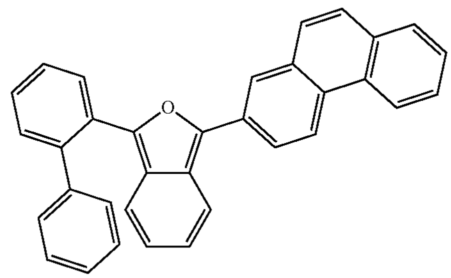
368
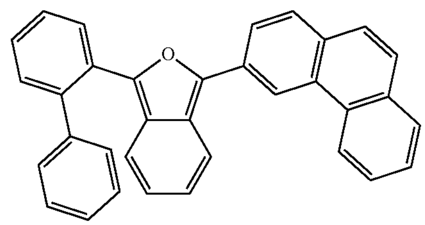
369
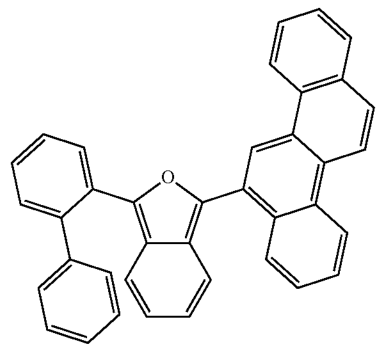

-continued
370
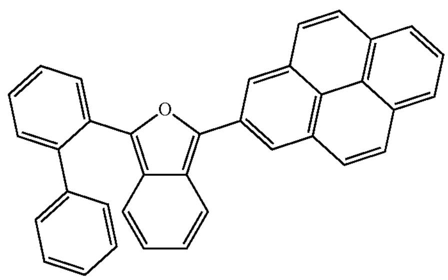
371
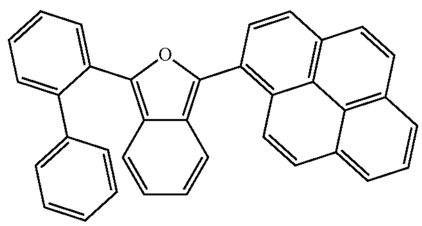
372
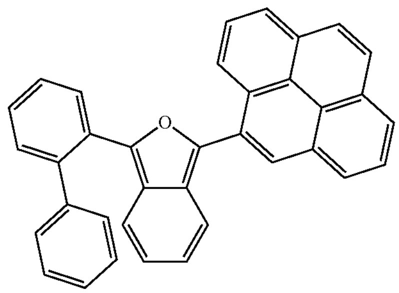
373
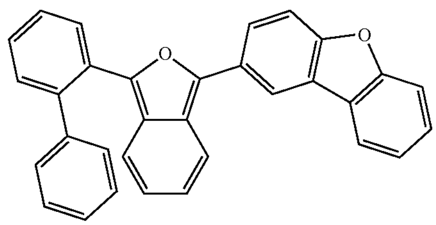
374
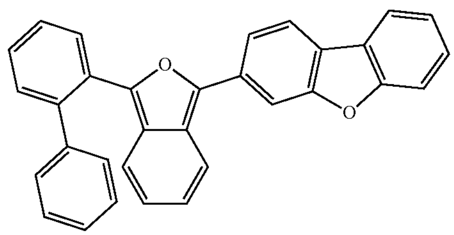
375
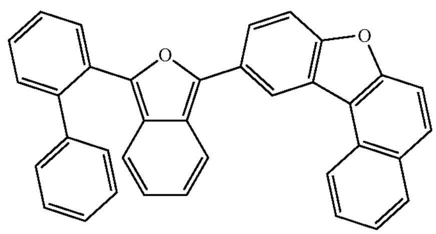
-continued
376
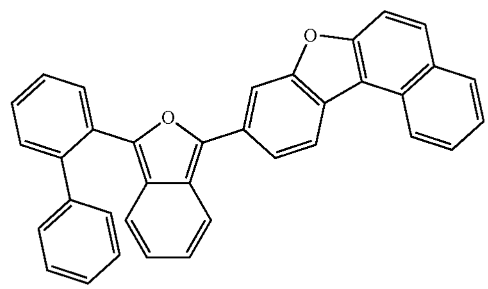
377
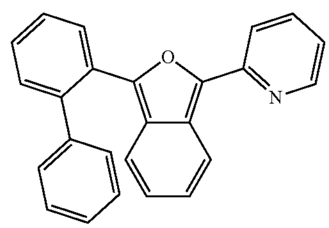
378
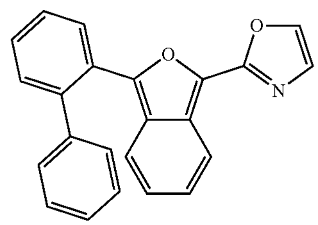
379
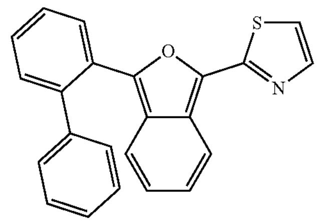
380
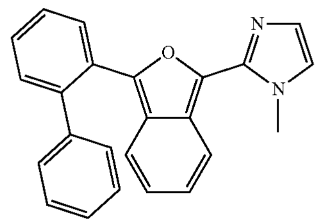
381
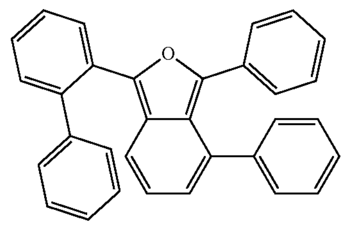

-continued
382
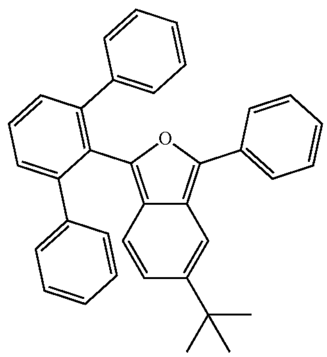
383
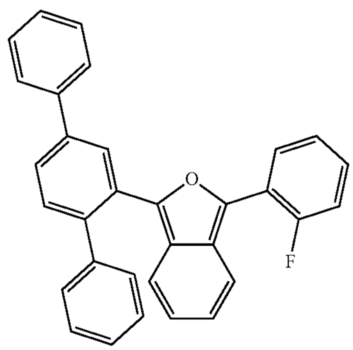
384
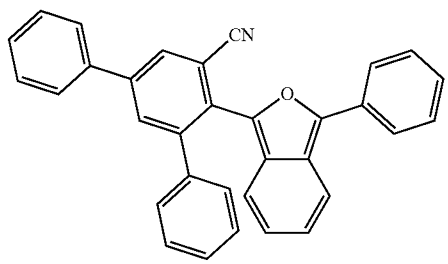
385
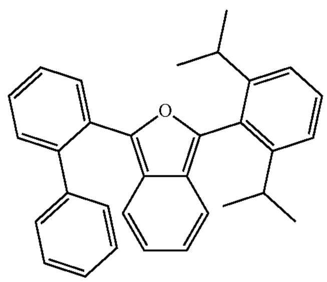
386
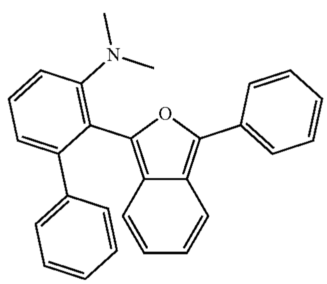
-continued
387
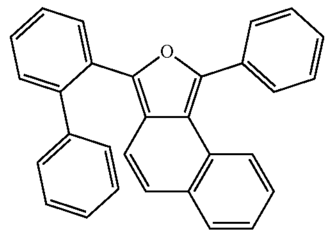
388
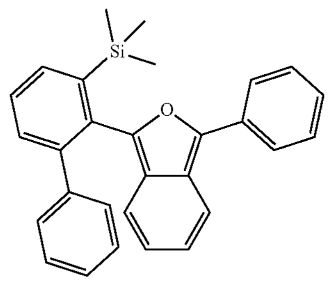
389
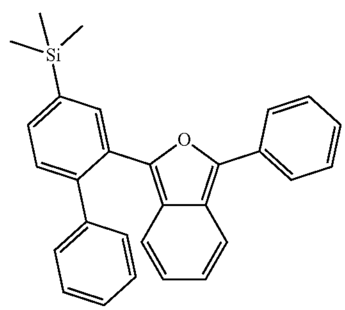
390
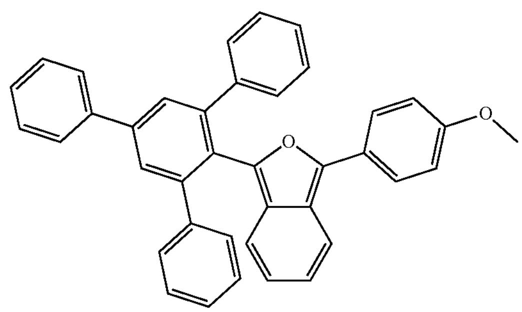
391
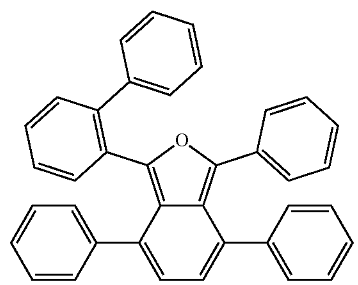

-continued
392
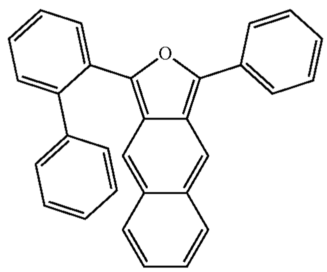
393
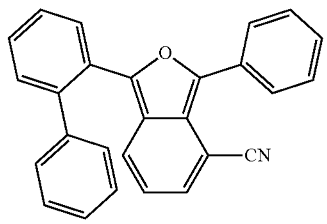
394
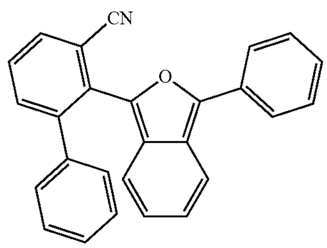
395
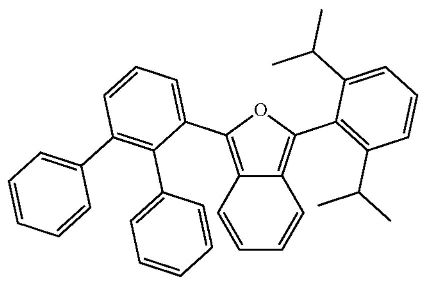
396
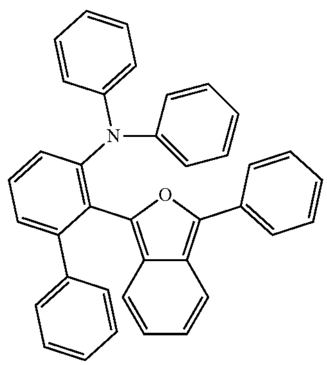
-continued
397
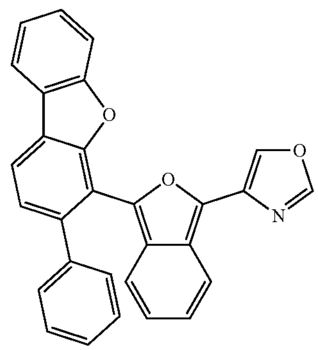
398
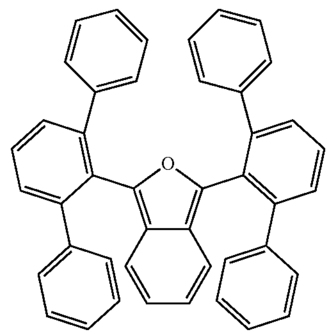
399
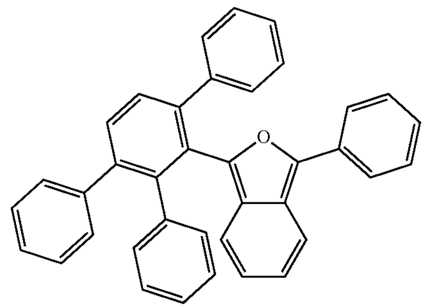
400
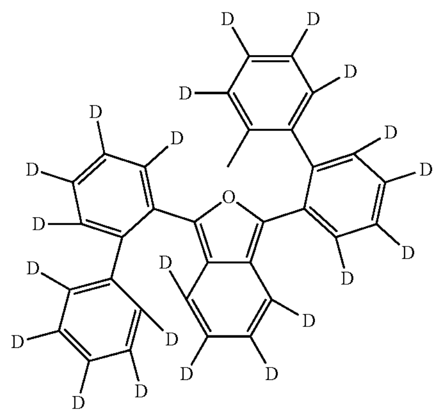
401
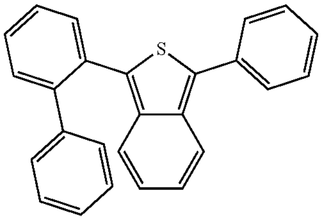

-continued
402
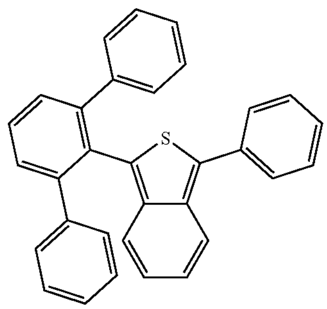
403
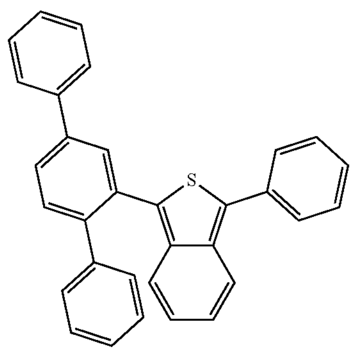
404
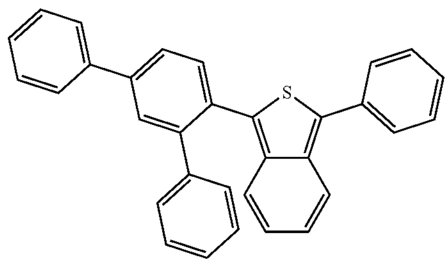
405
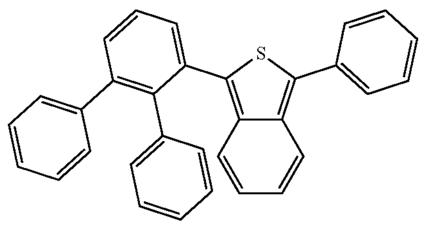
406
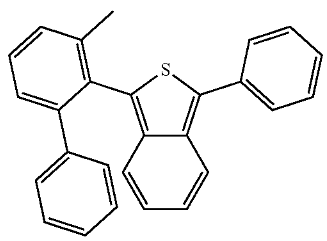
-continued
407
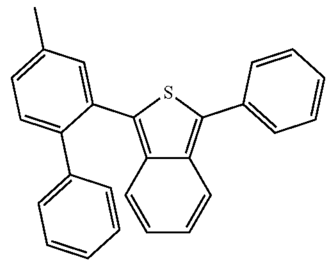
408
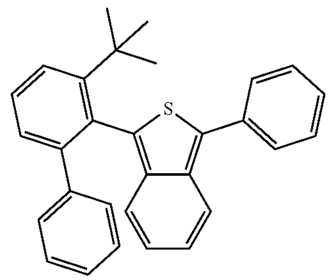
409
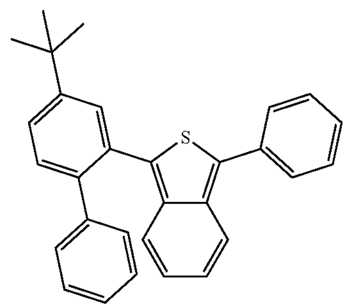
410
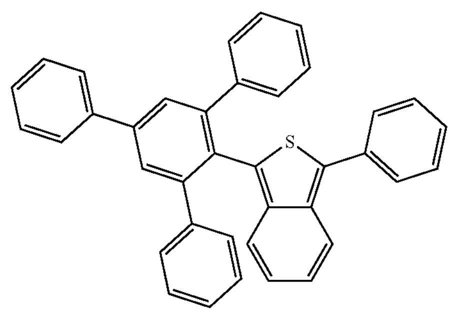
411
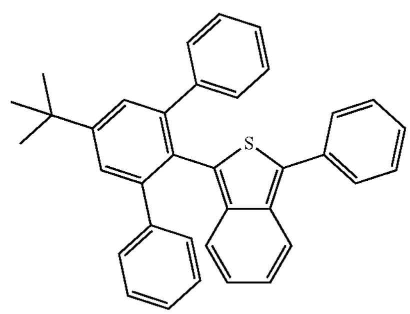

-continued
412
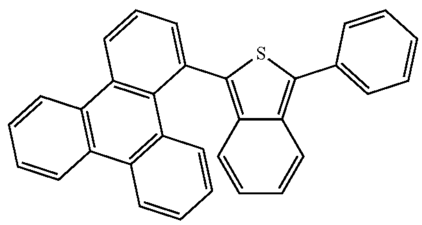
413
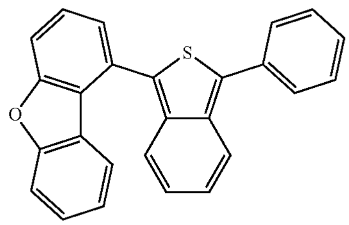
414
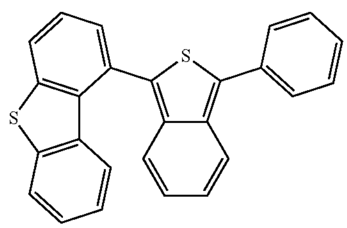
415
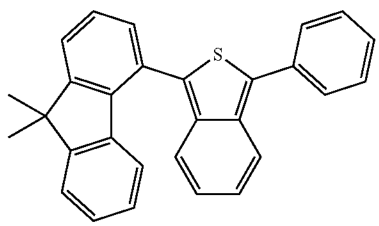
416
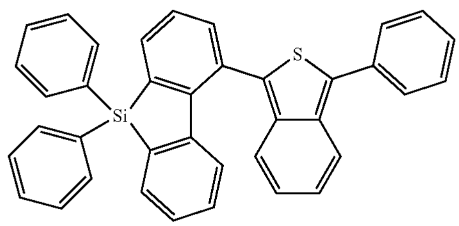
417
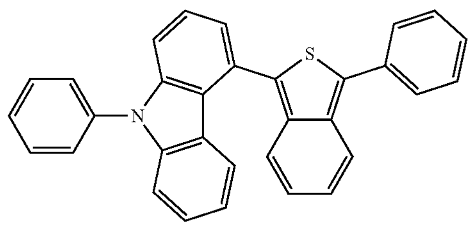
-continued
418
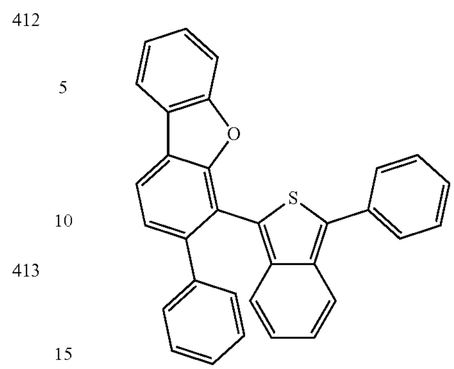
419
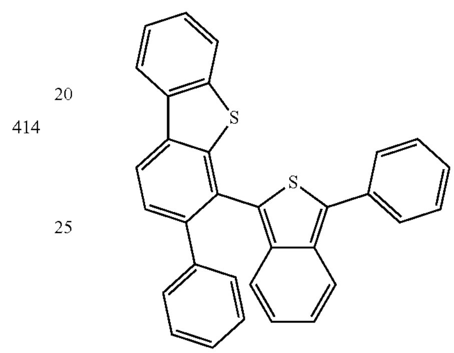
420
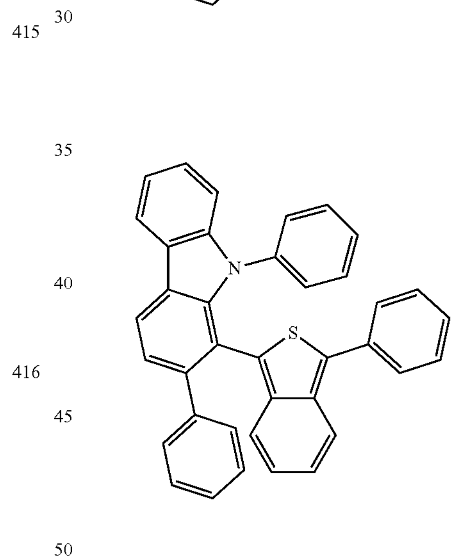
421
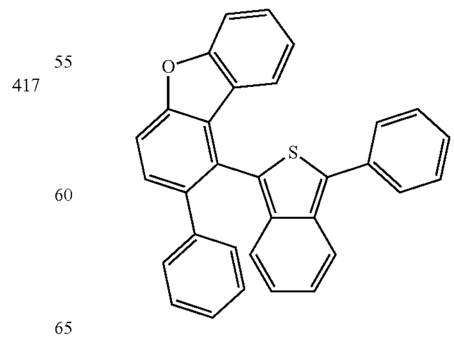

-continued
422
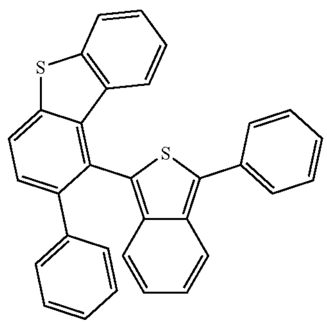
423
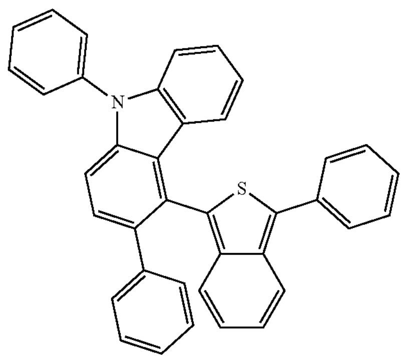
424
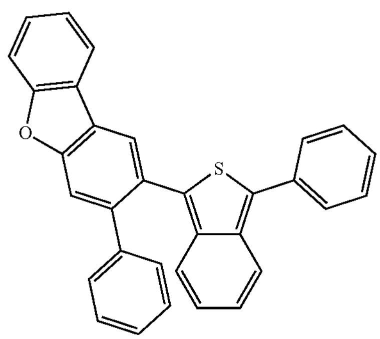
425
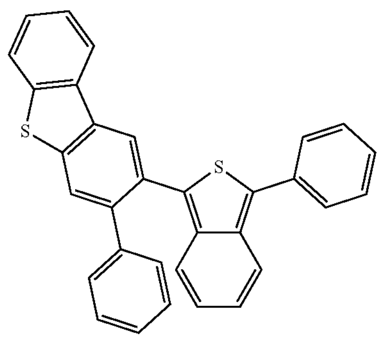
-continued
426
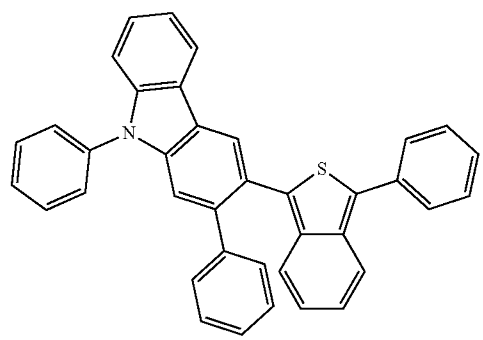
427
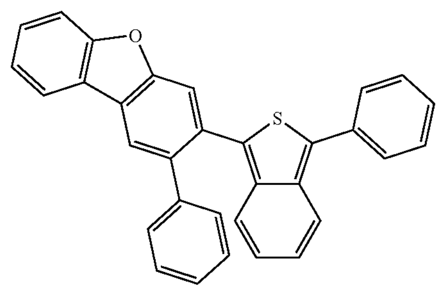
428
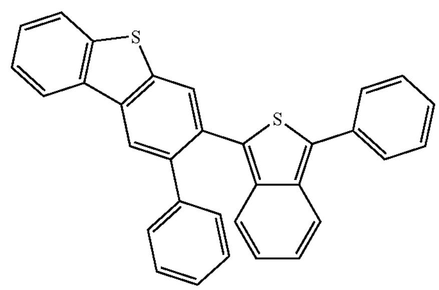
429
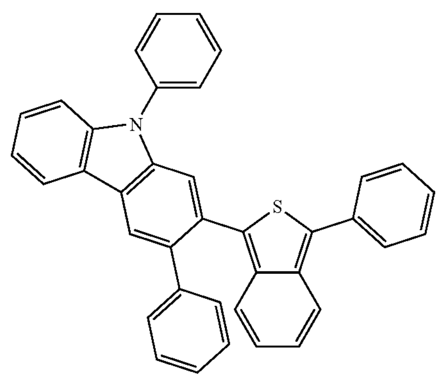
430
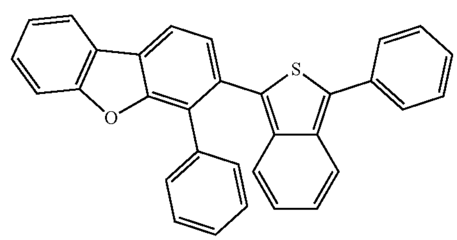

-continued
431
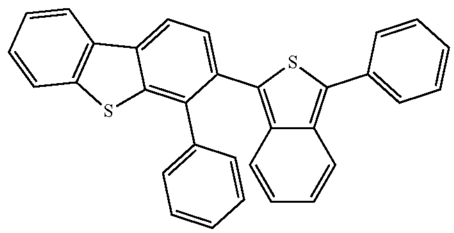
432
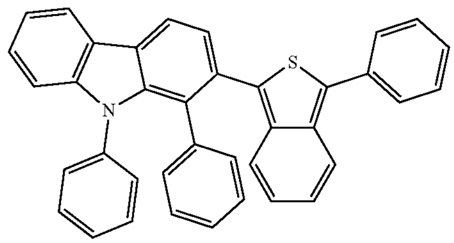
433
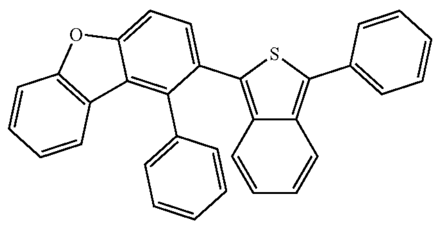
434
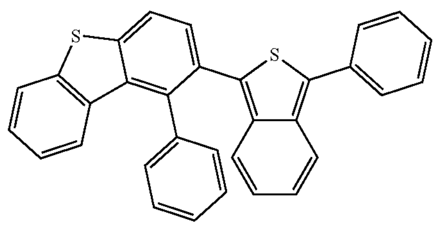
435
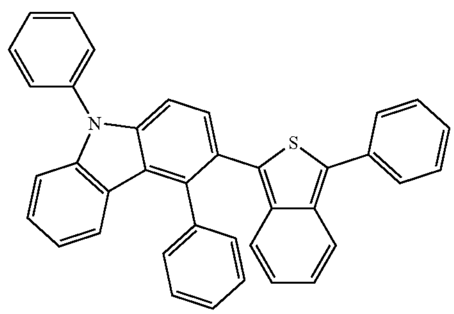
436
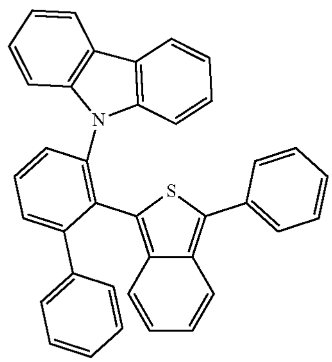
-continued
437
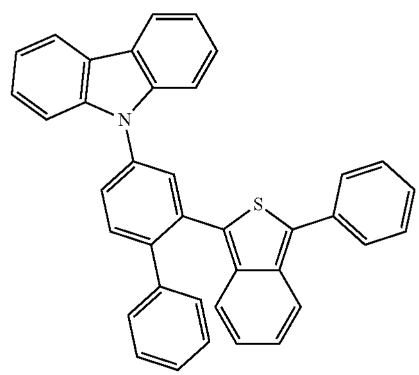
438
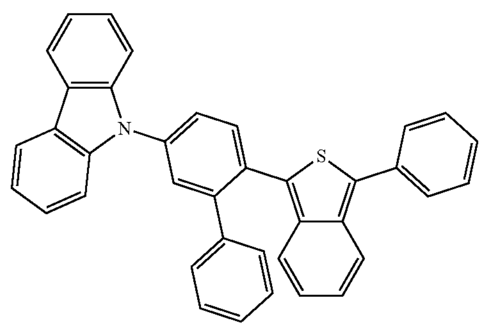
439
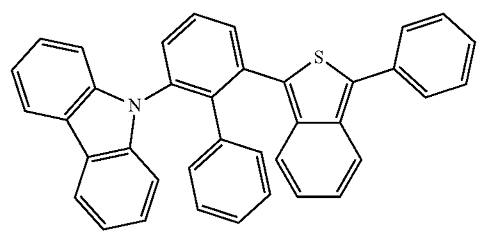
440
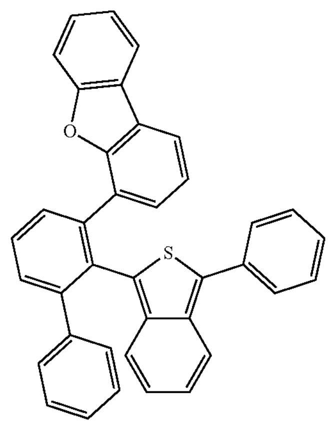

-continued
441
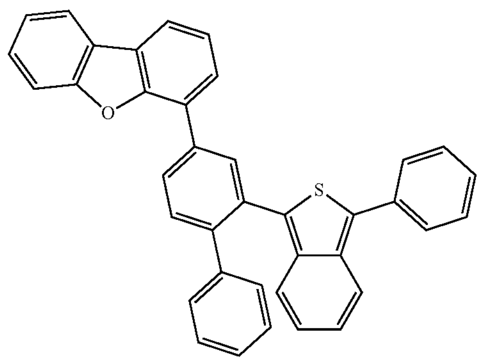
442
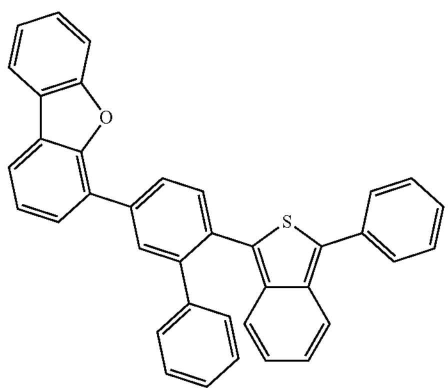
443
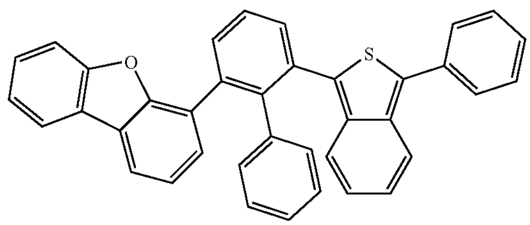
444
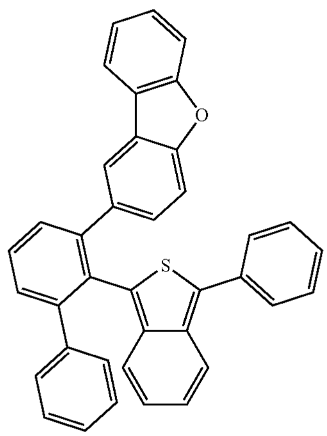
-continued
445
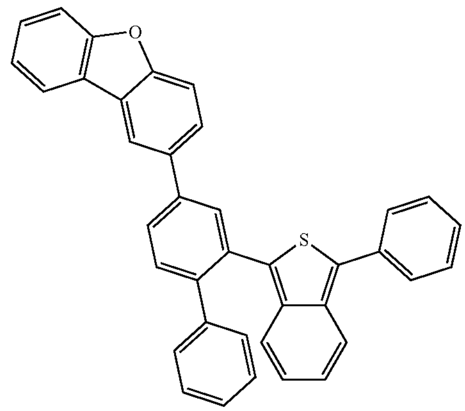
446
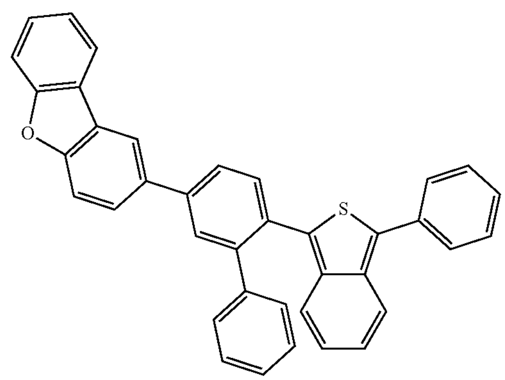
447
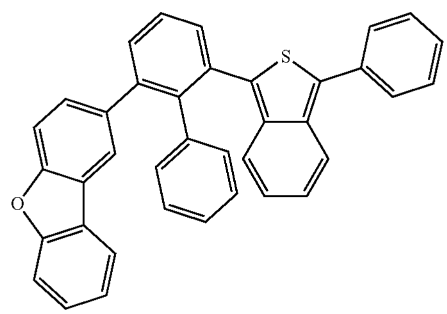
448
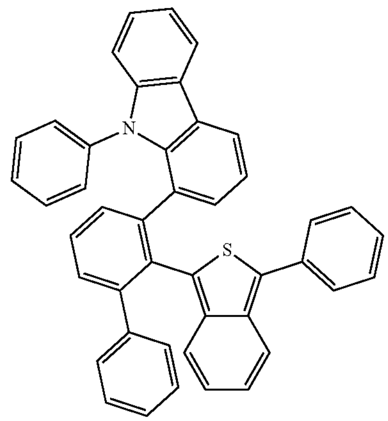

-continued
449
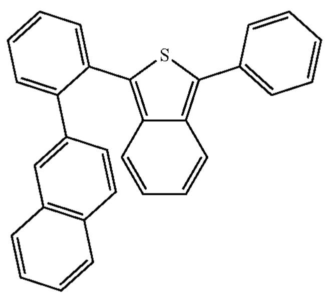
450
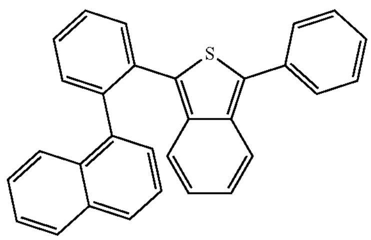
451
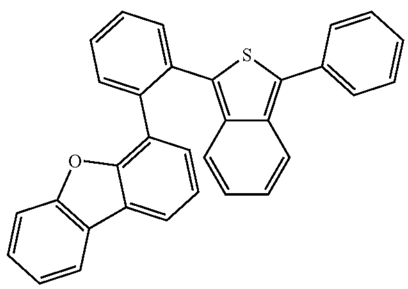
452
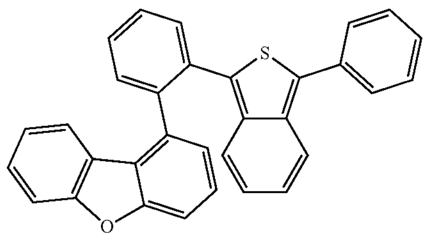
453
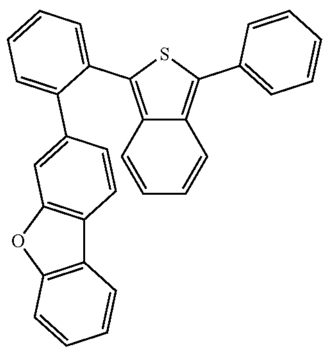
-continued
454
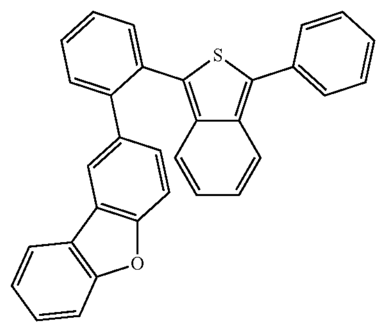
455
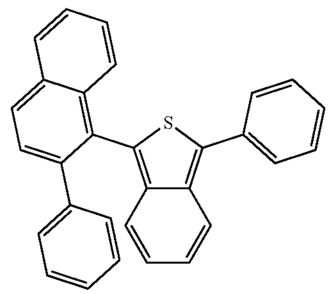
456
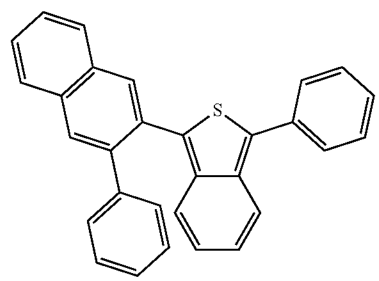
457
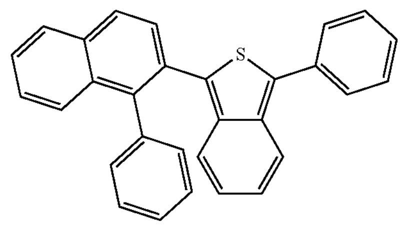
458
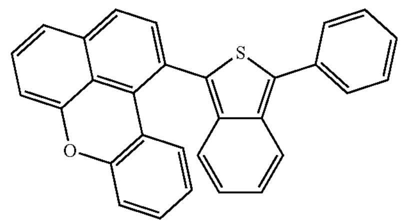

-continued
459
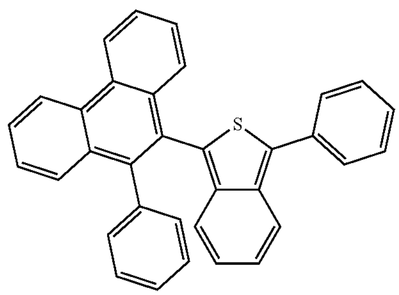
460
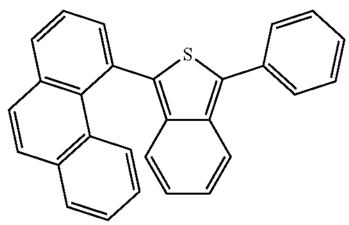
461
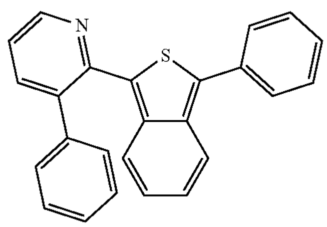
462
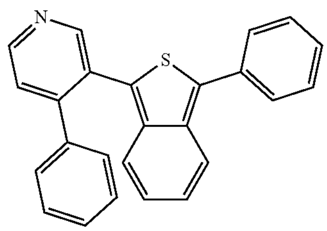
463
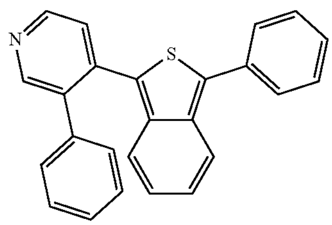
464
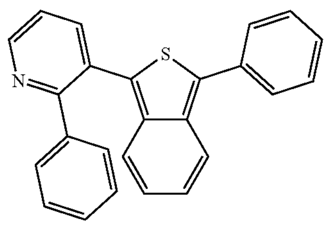
-continued
465
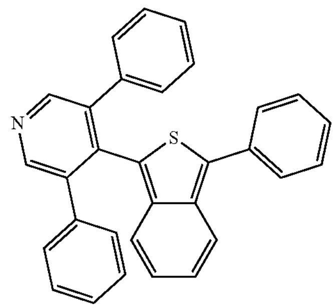
466
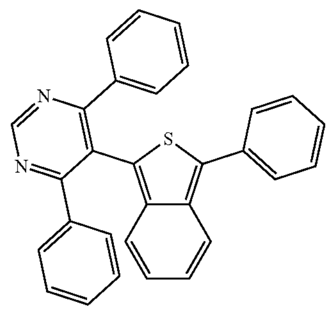
467
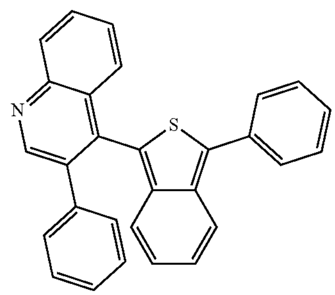
468
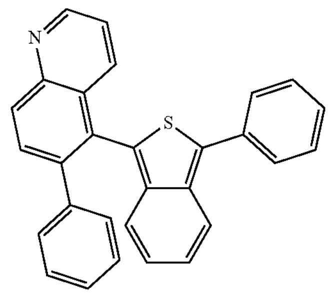
469
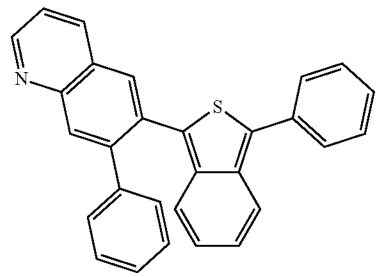

-continued
470
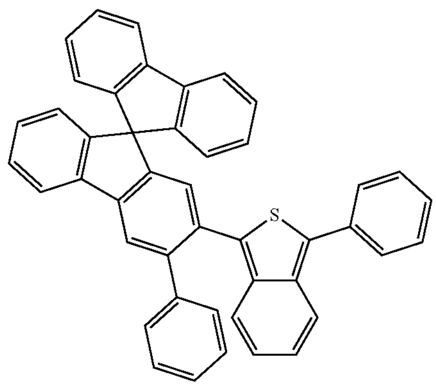
471
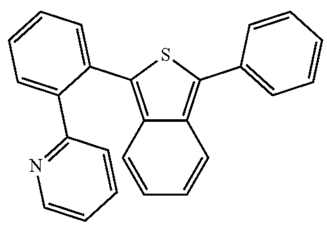
472
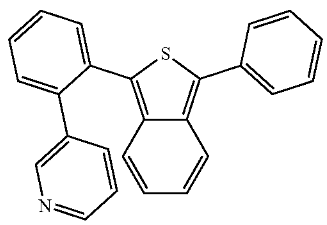
473
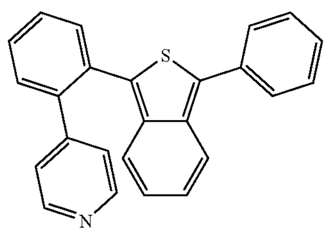
474
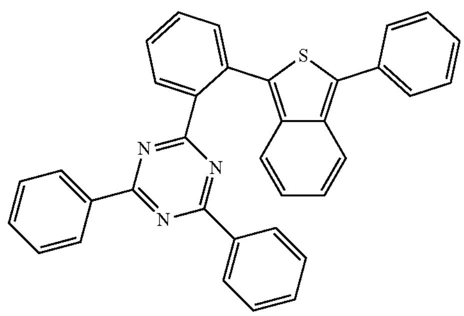
-continued
475
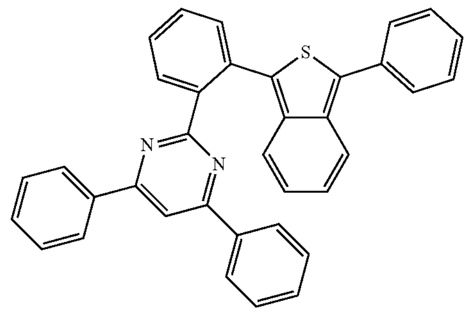
476
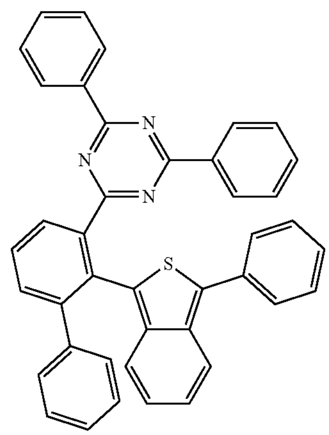
477
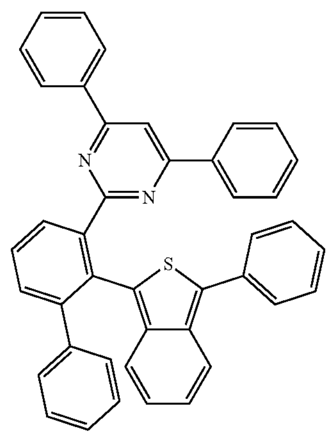
478
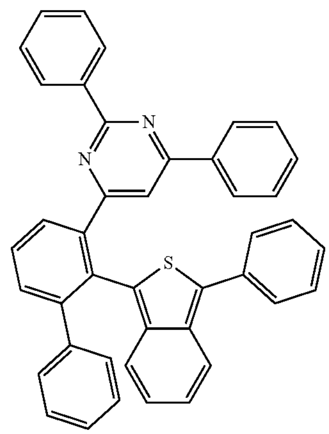

-continued
479
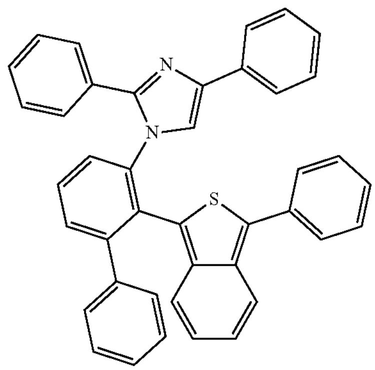
480
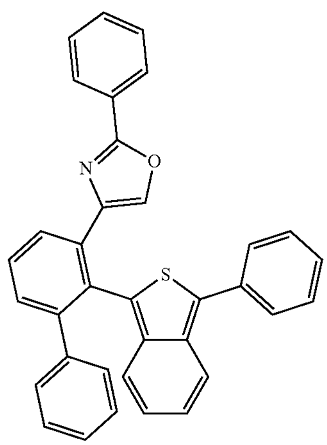
481
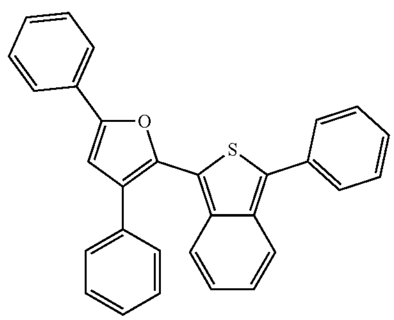
482
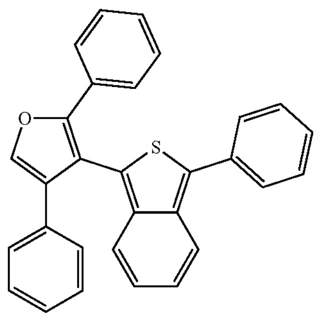
-continued
483
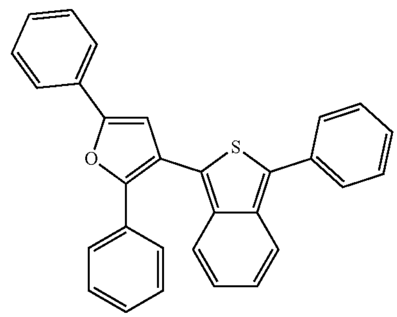
484
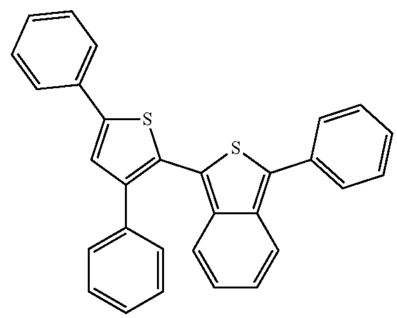
485
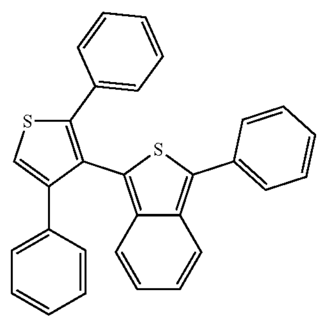
486
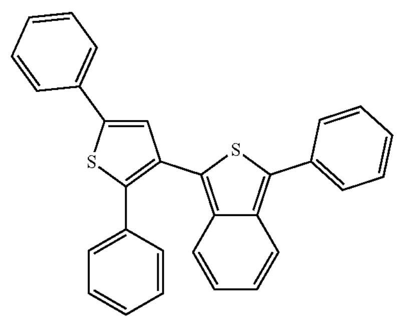
487
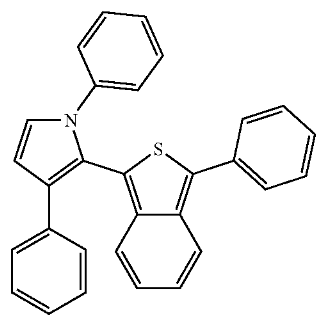

-continued
488
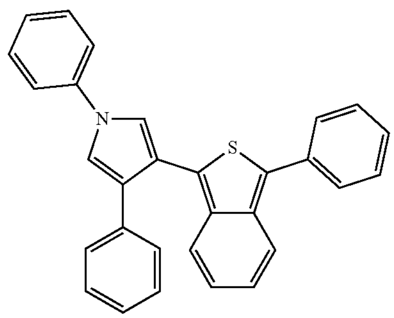
489
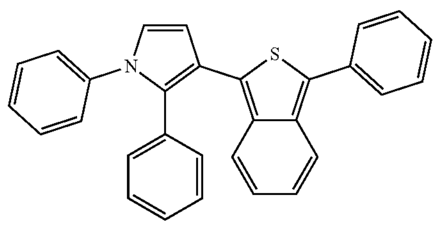
490
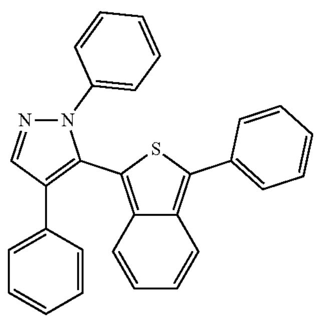
491
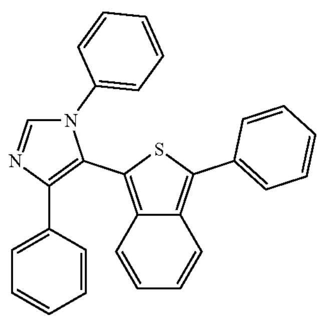
492
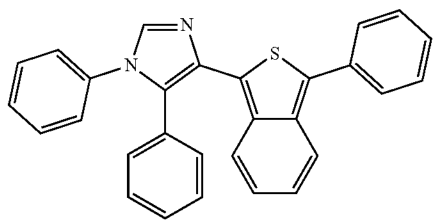
493
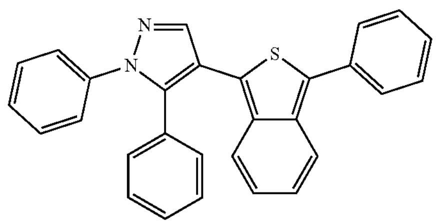
-continued
494
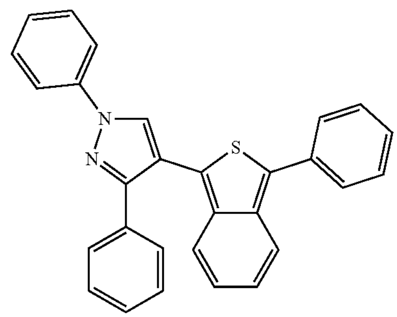
495
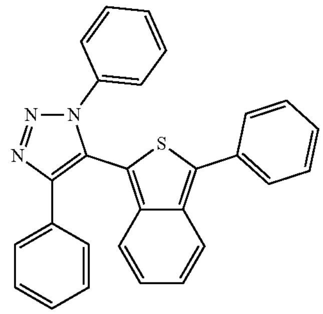
496
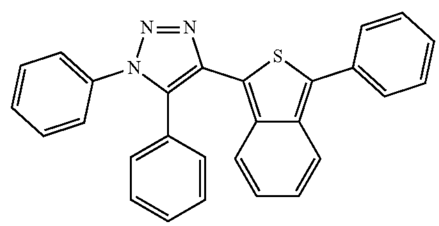
497
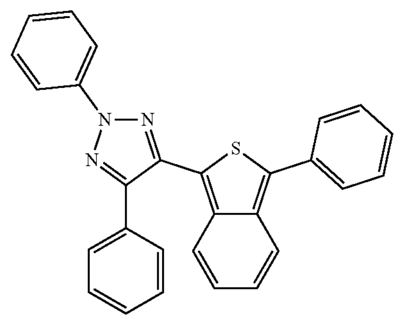
498
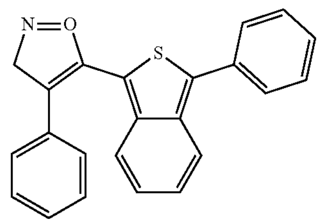
499
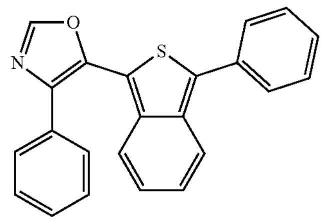

-continued
500
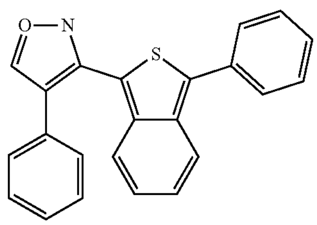
501
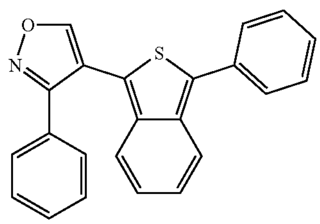
502
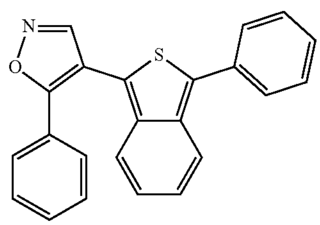
503
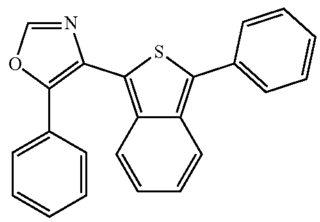
504
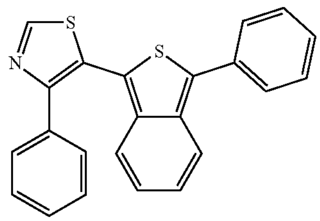
505
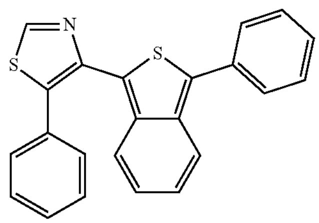
506
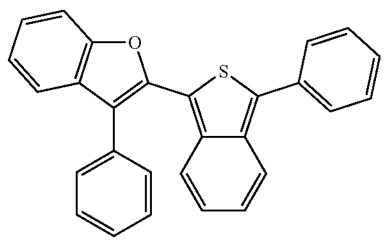
-continued
507
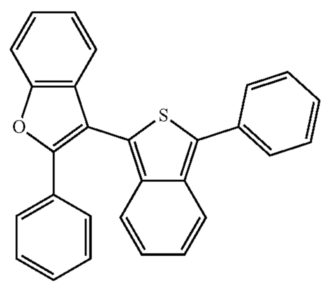
508
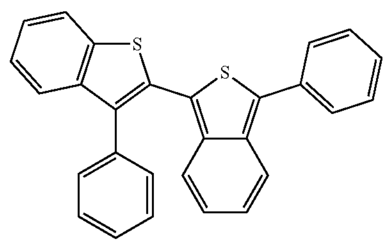
509
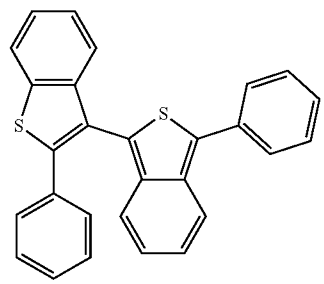
510
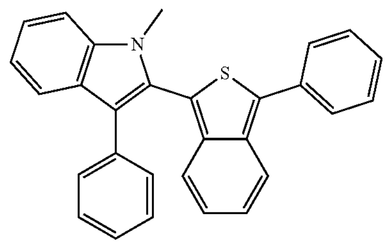
511
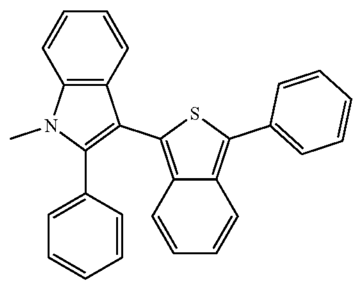

-continued
512
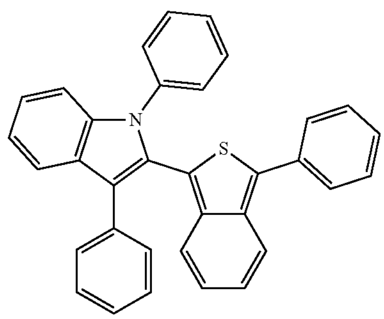
513
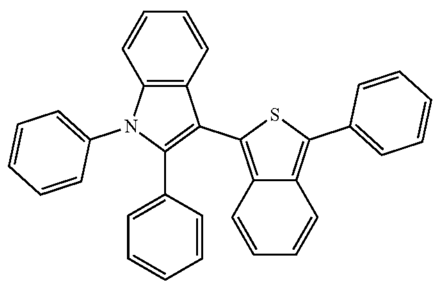
514
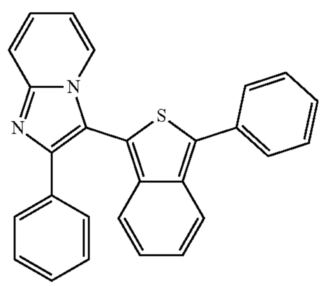
515
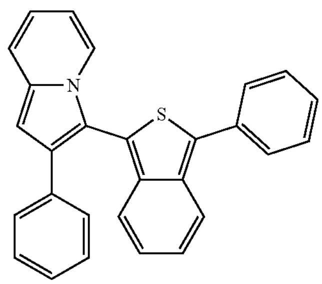
516
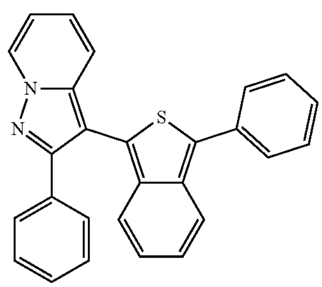
-continued
517
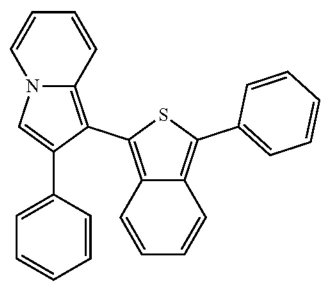
518
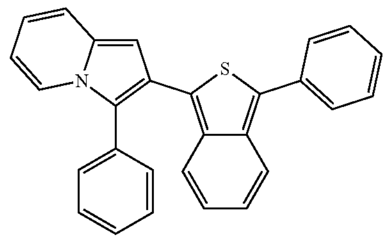
519
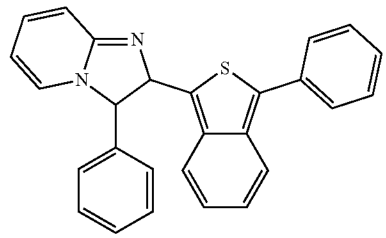
520
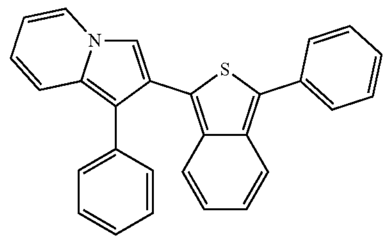
521
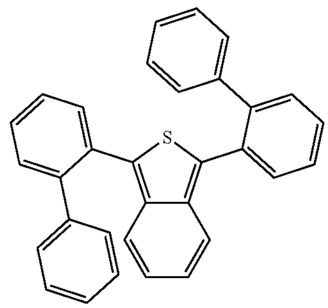
522
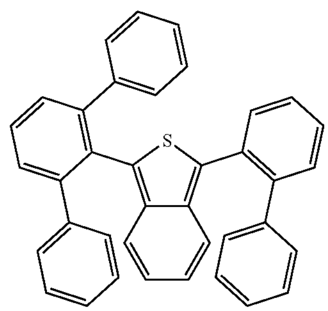

-continued
523
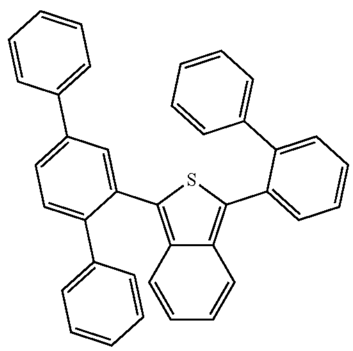
524
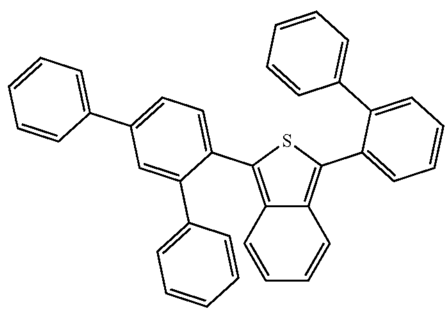
525
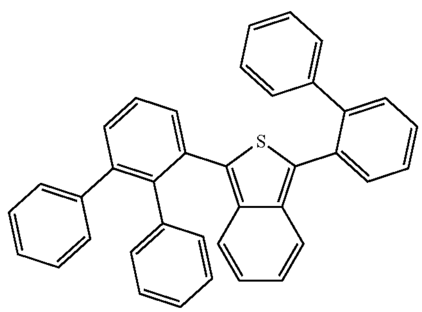
526
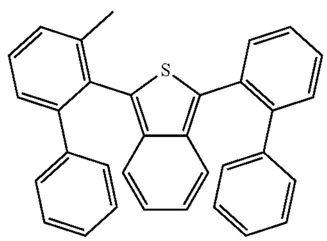
527
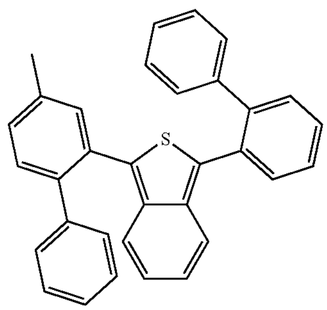
-continued
528
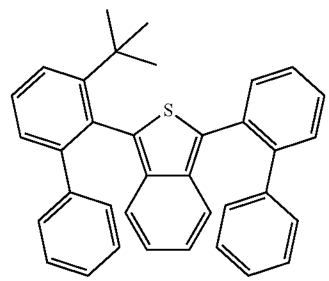
529
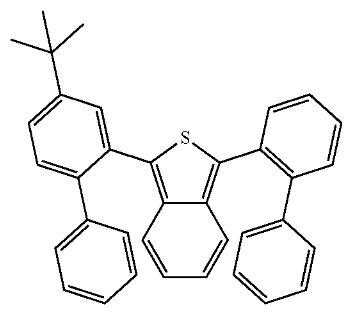
530
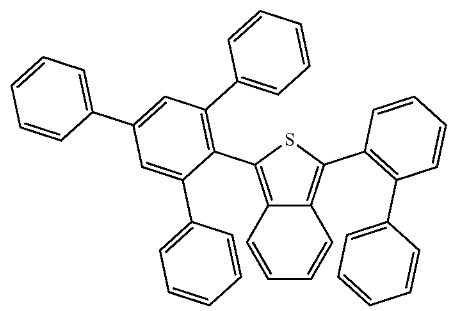
531
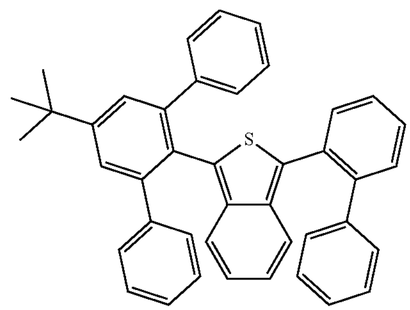
532
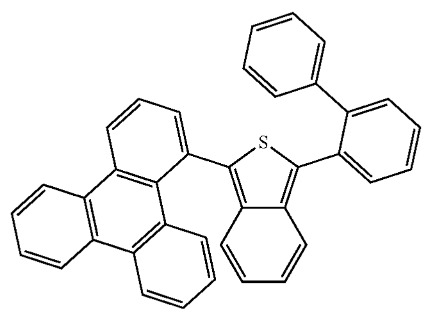

-continued
533
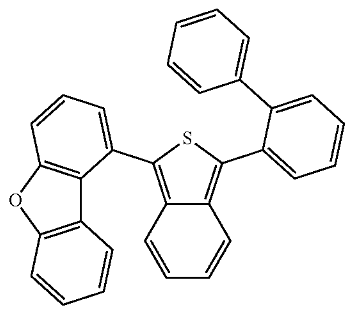
534
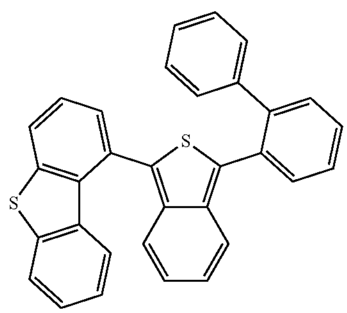
535
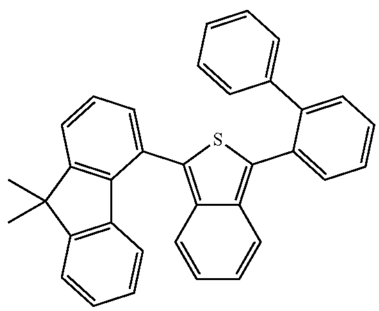
536
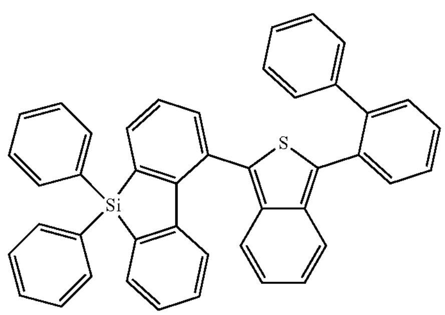
537
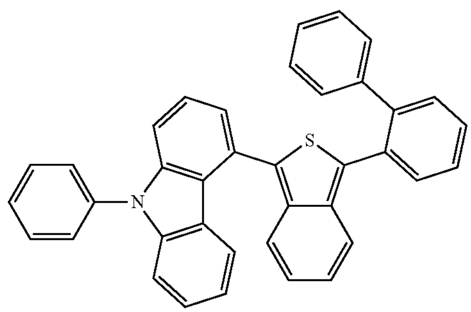
-continued
538
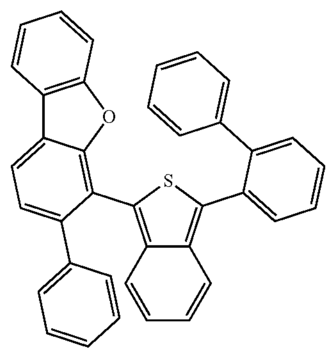
539
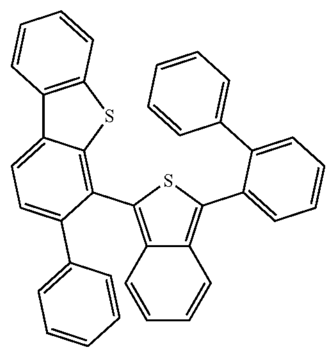
540
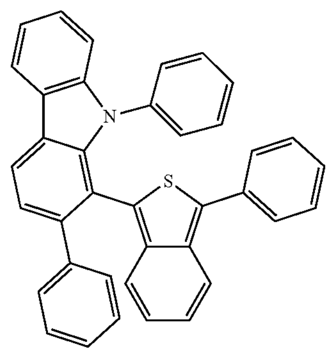
541
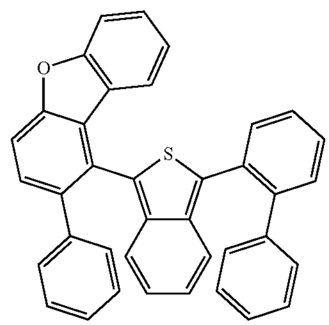

-continued
542
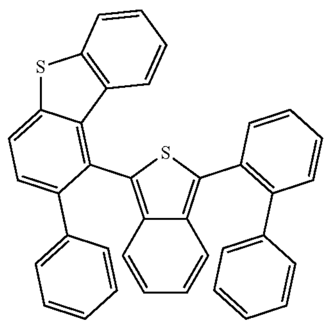
543
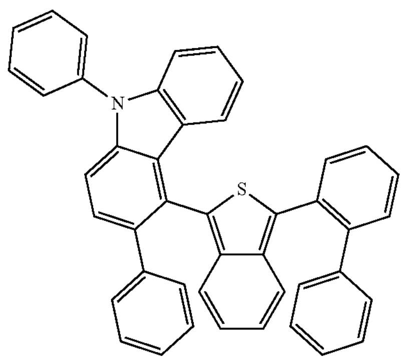
544
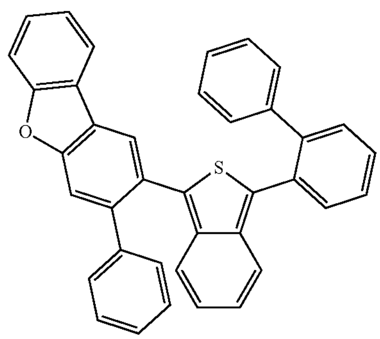
545
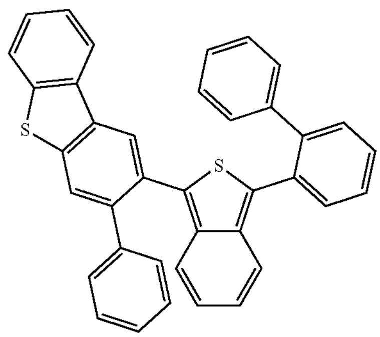
-continued
546
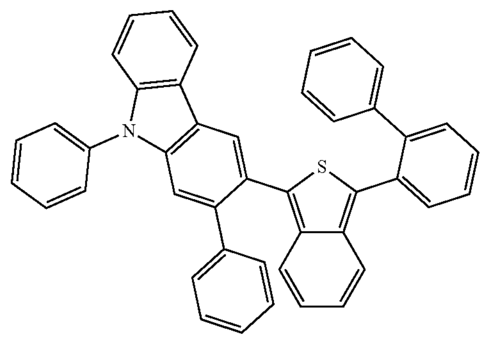
547
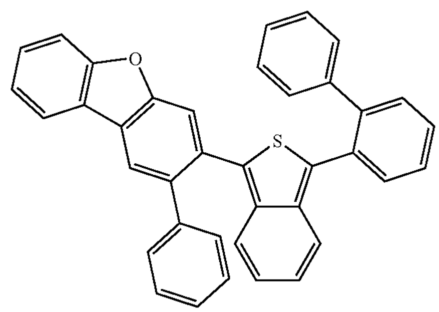
548
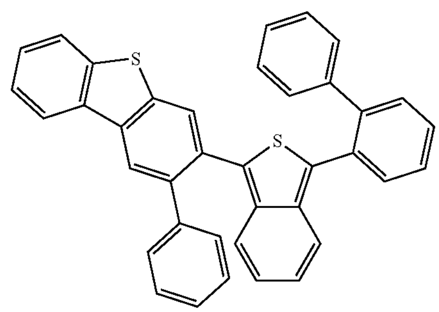
549
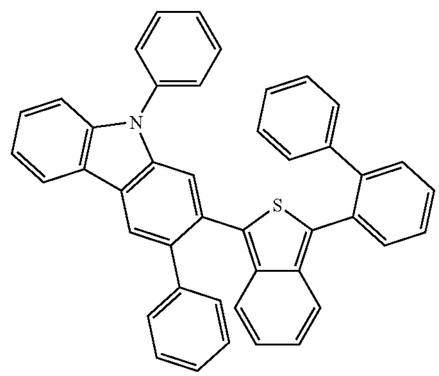
550
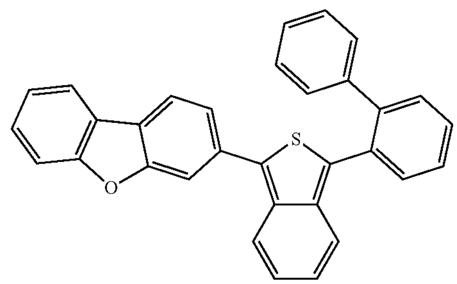

-continued
551
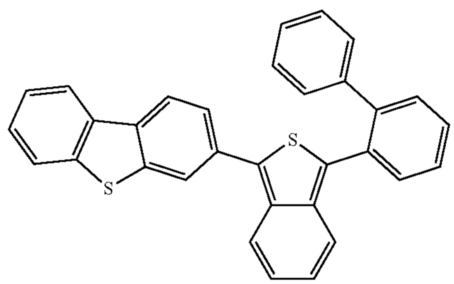
552
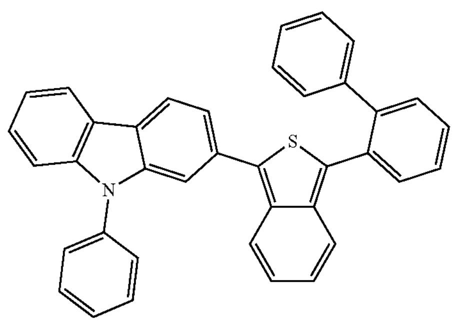
553
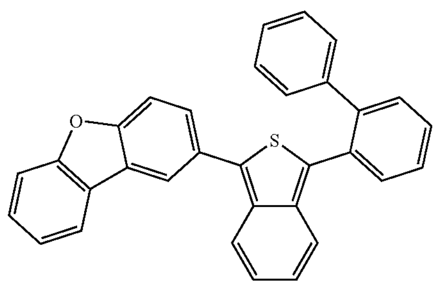
554
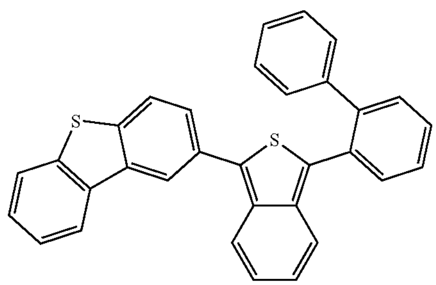
555
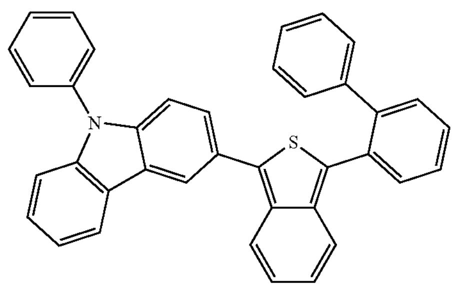
-continued
556
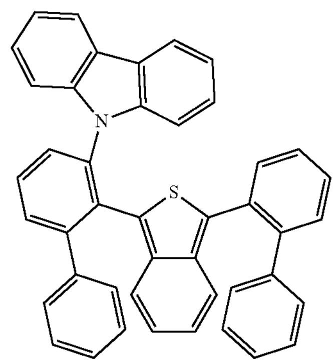
557
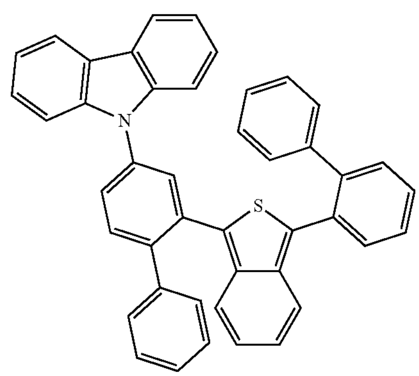
558
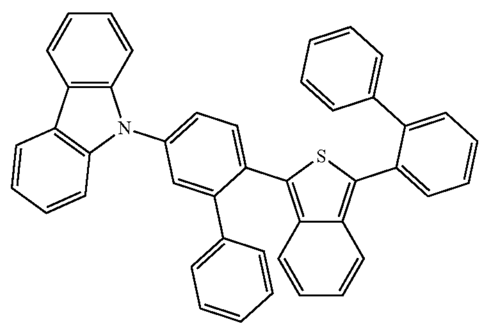
559
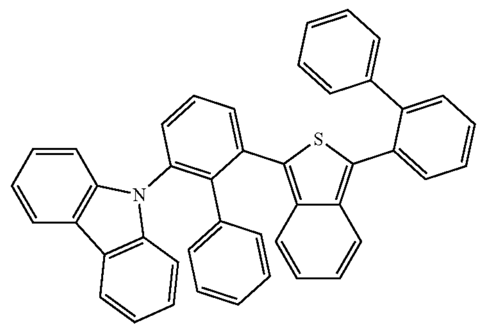

-continued
560
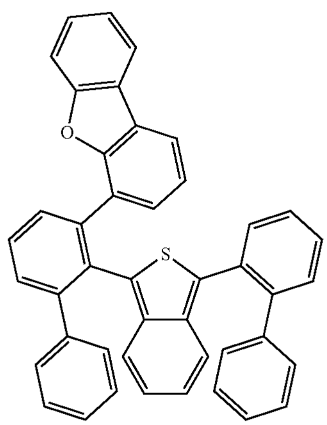
561
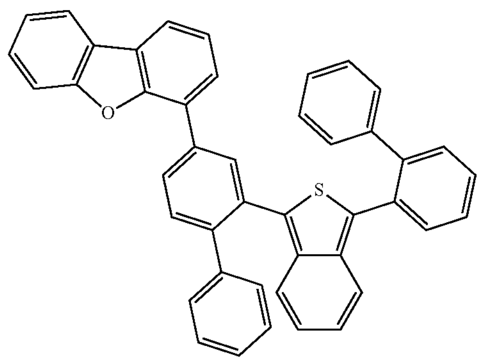
562
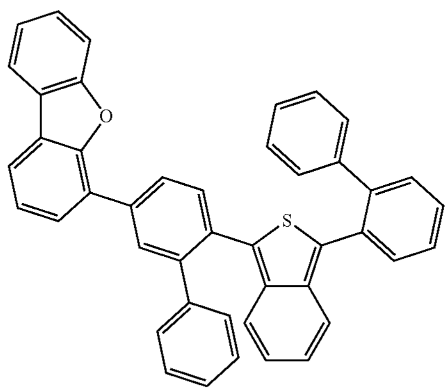
563
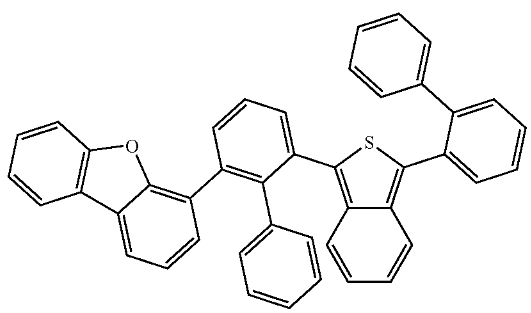
-continued
564
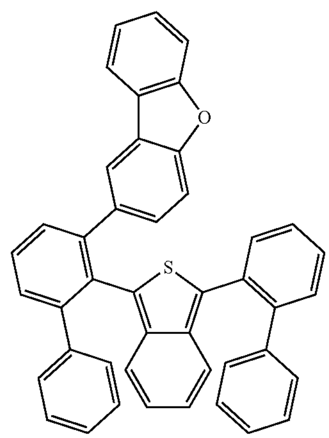
565
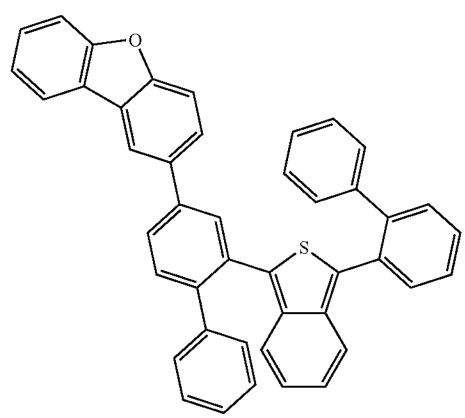
566
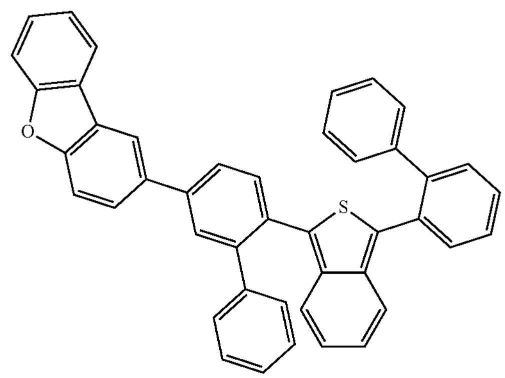
567
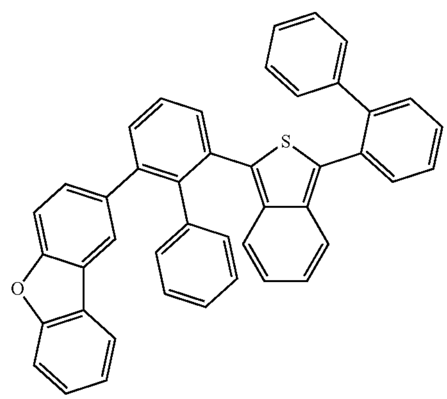

-continued
568
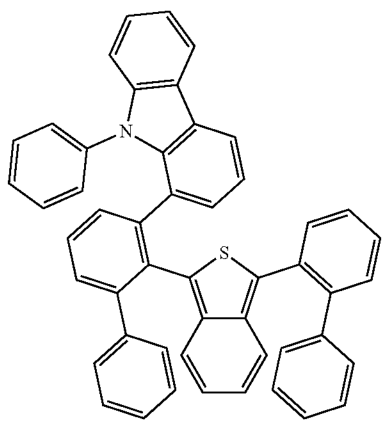
569
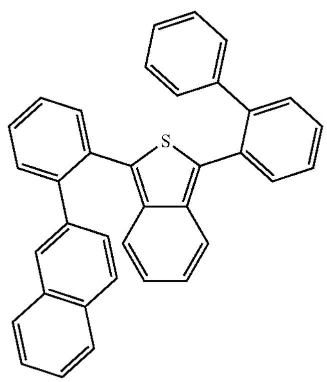
570
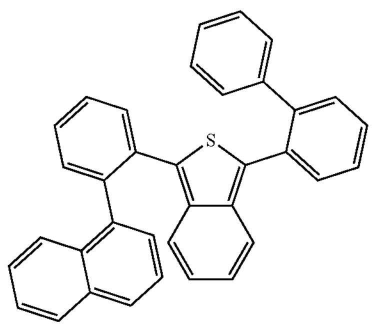
571
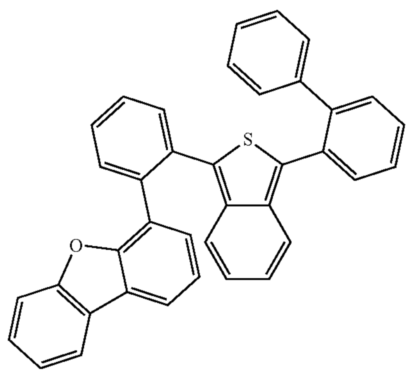
-continued
572
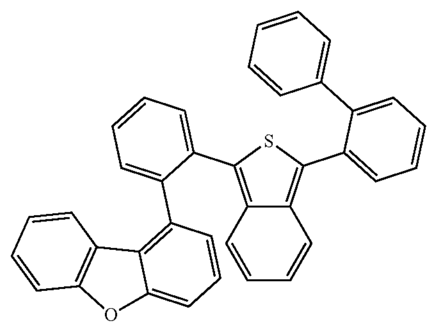
573
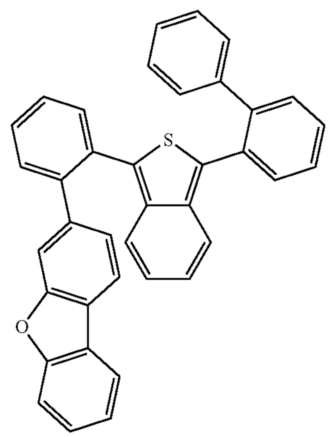
574
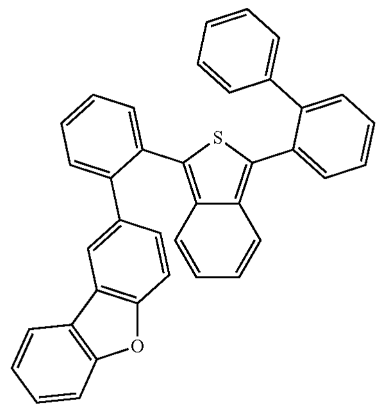
575
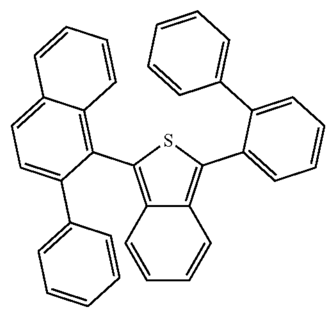

-continued
576
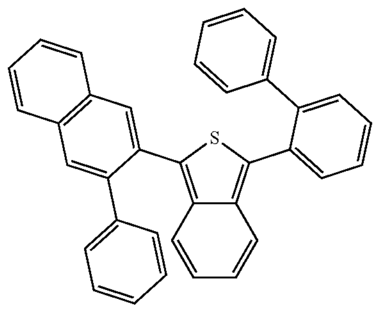
577
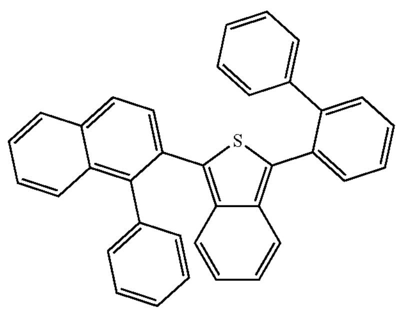
578
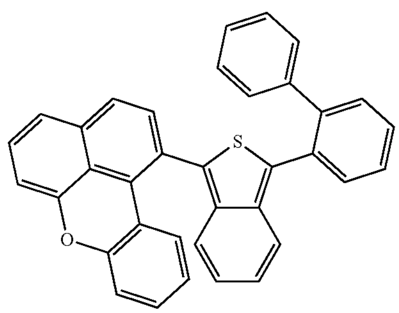
579
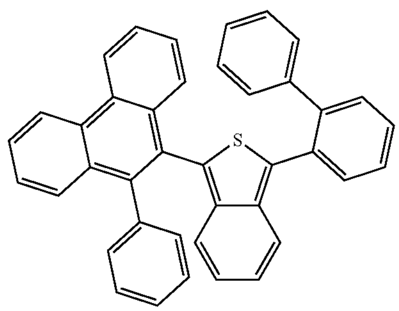
580
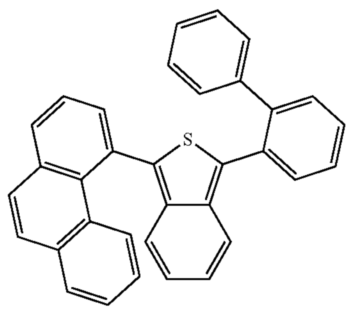
-continued
581
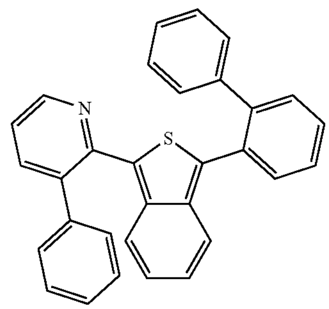
582
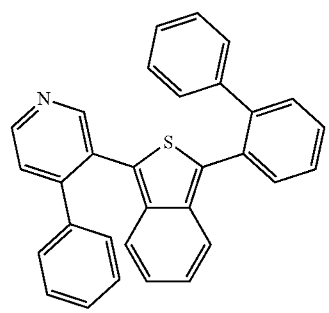
583
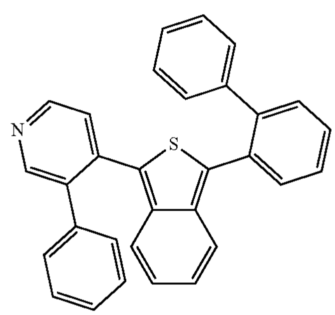
584
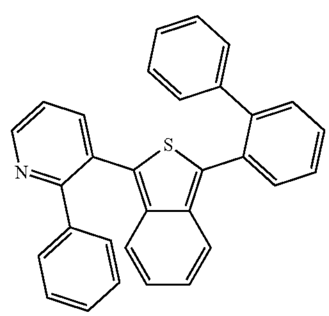
585
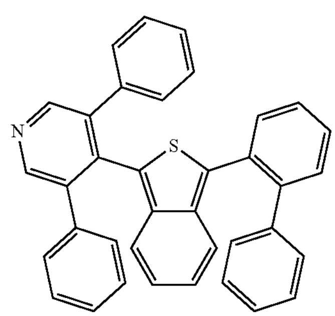

-continued
586
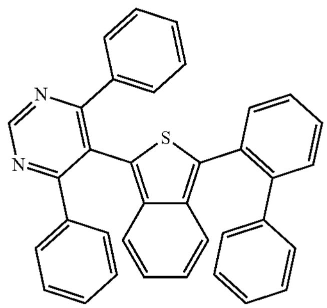
587
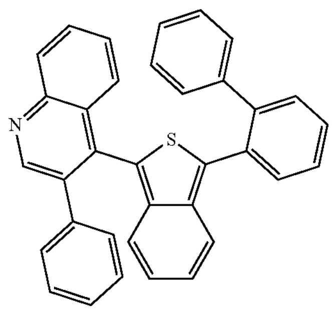
588
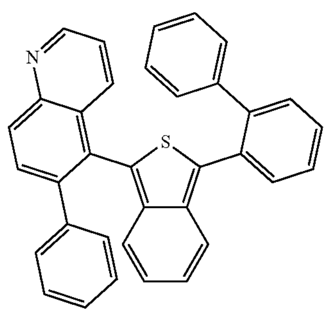
589
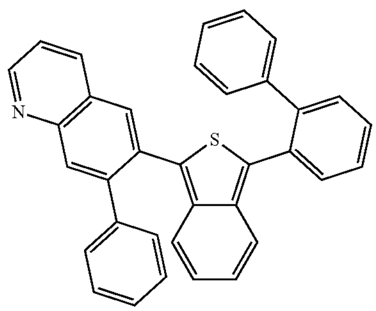
590
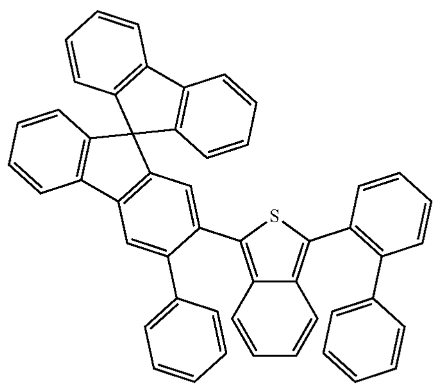
-continued
591
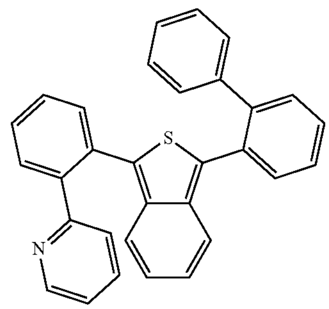
592
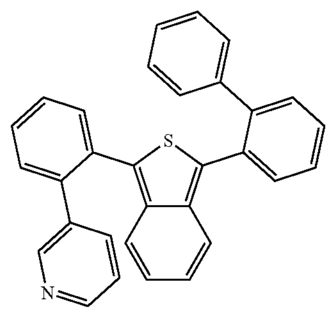
593
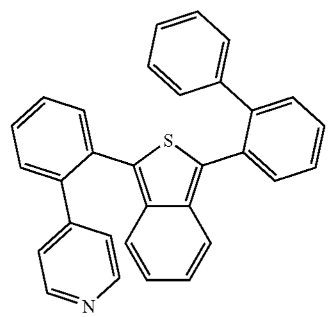
594
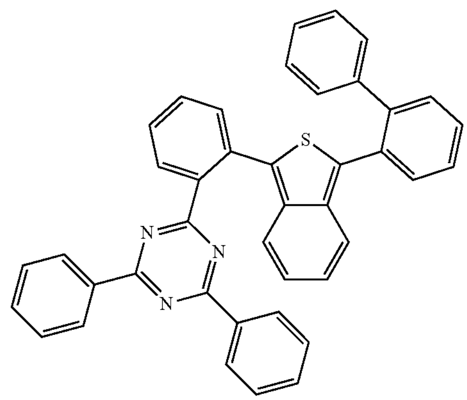

595
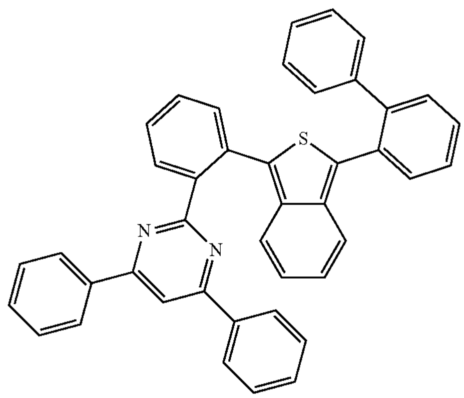
596
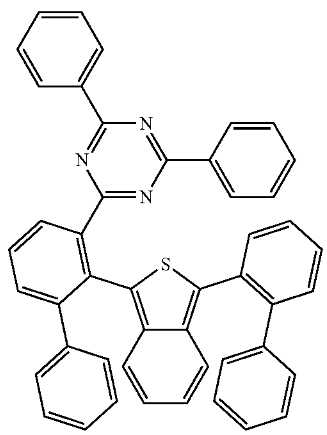
597
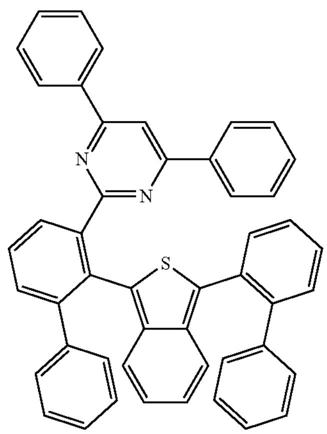
598
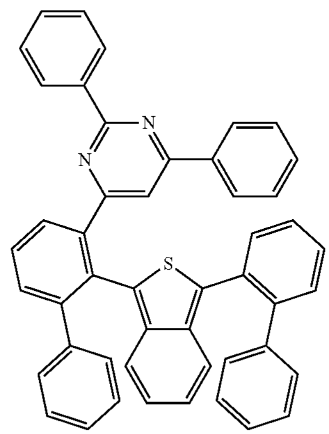
599
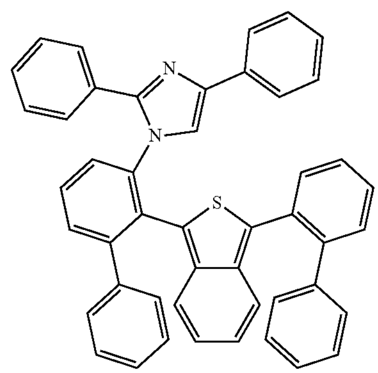
600
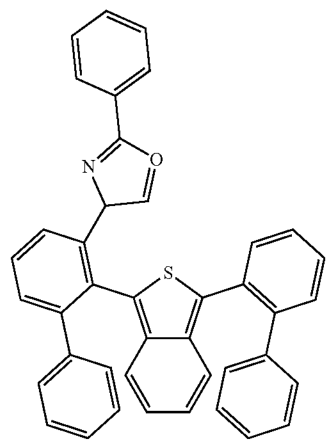
601
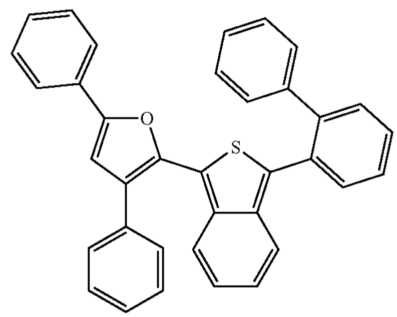

-continued
602
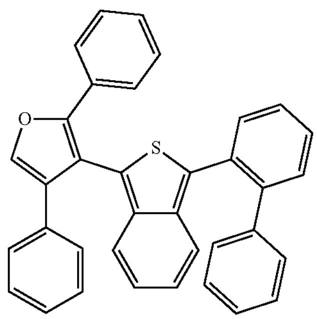
603
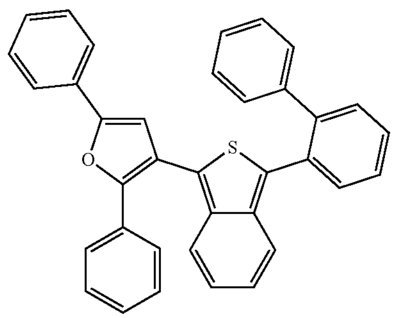
604
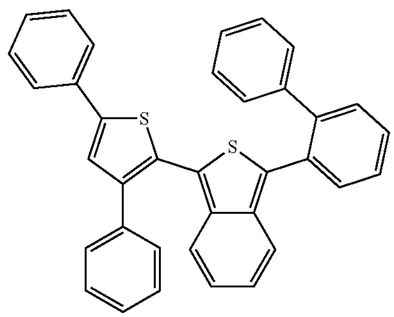
605
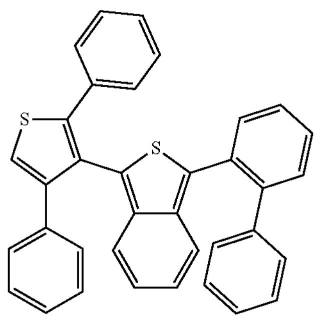
606
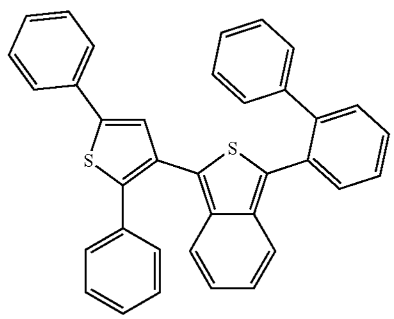
-continued
607
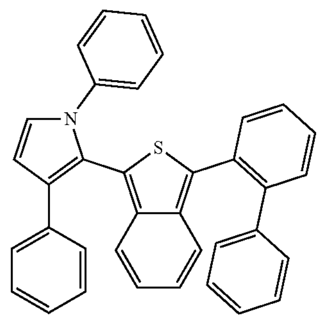
608
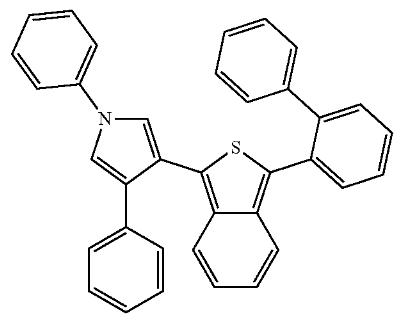
609
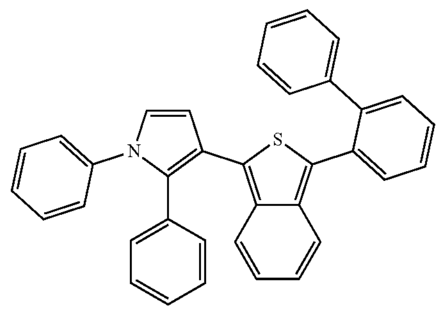
610
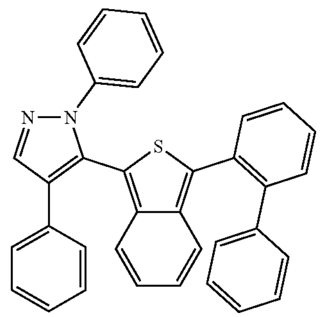
611
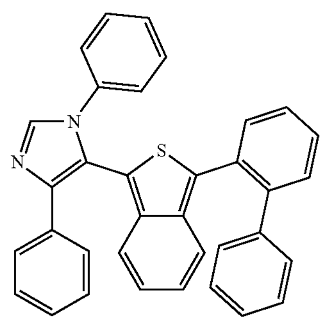

-continued
612
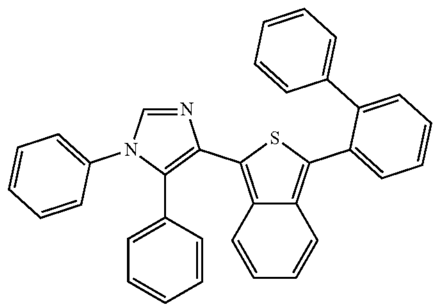
613
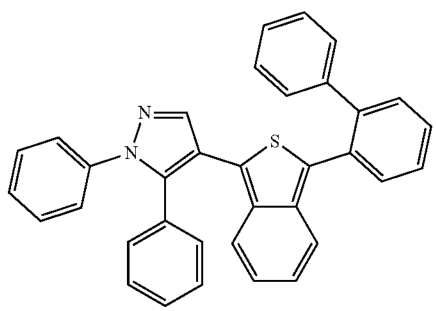
614
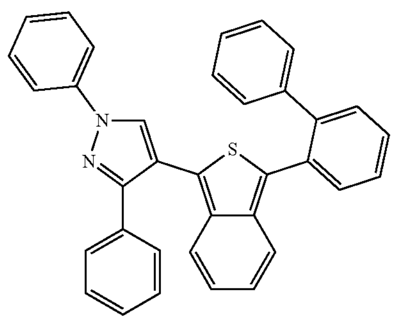
615
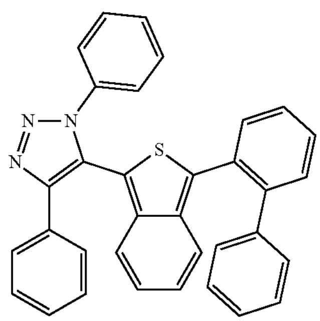
616
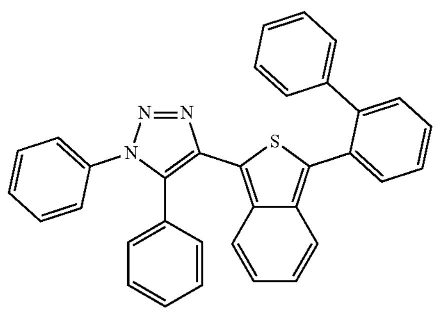
-continued
617
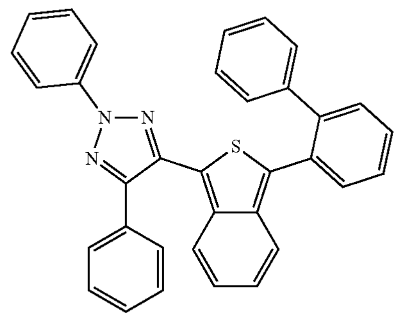
618
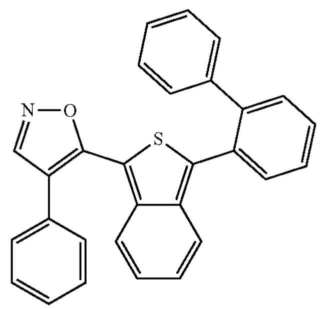
619
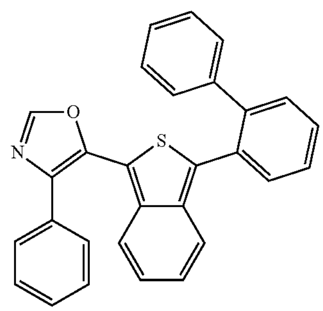
620
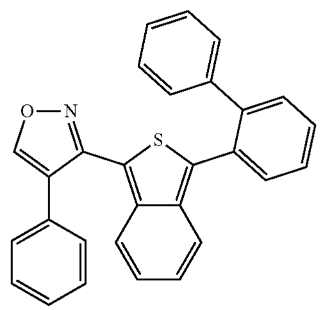
621
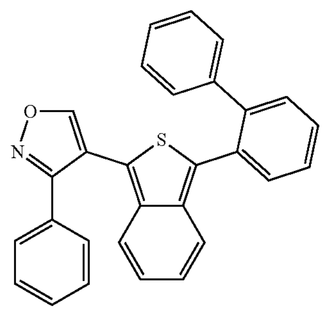

-continued
622
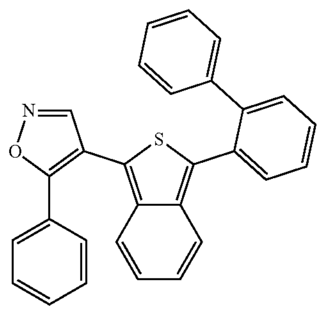
623
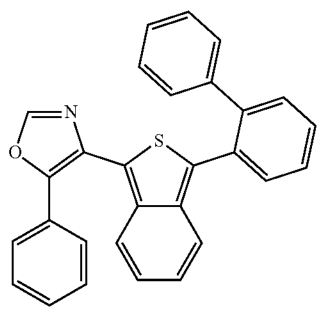
624
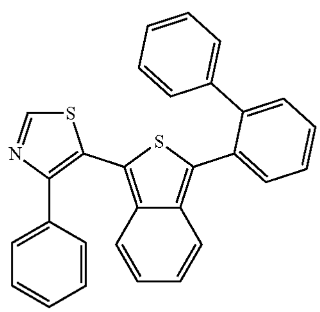
625
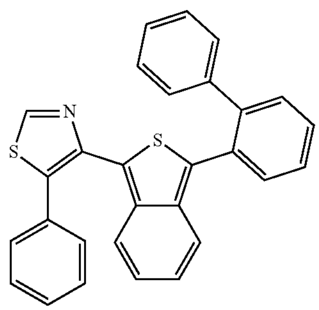
626
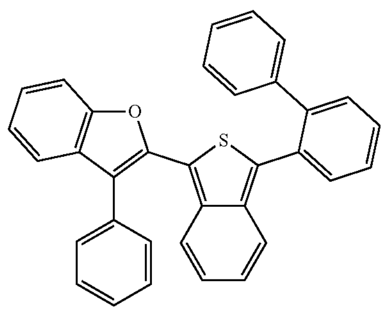
-continued
627
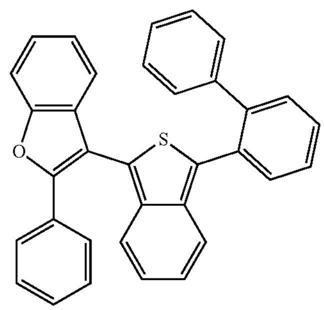
628
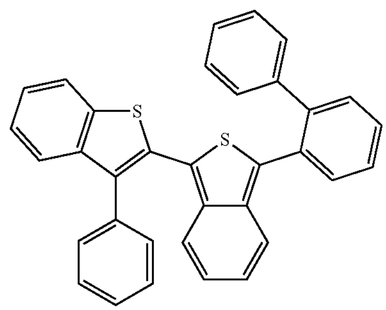
629
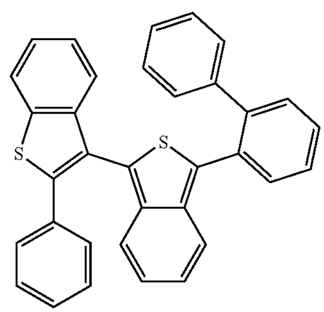
630
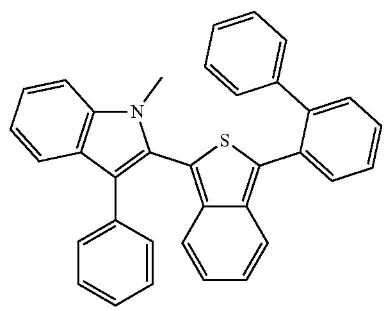
631
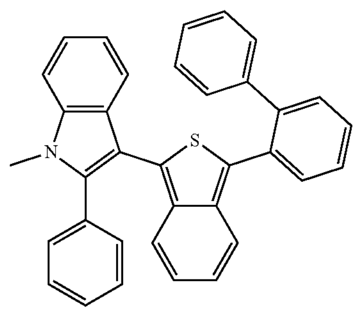

-continued
632
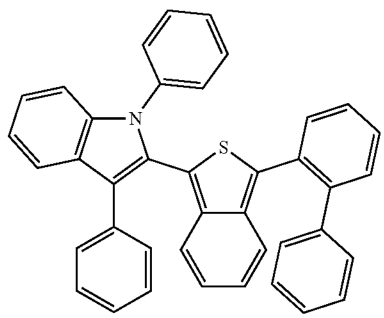
633
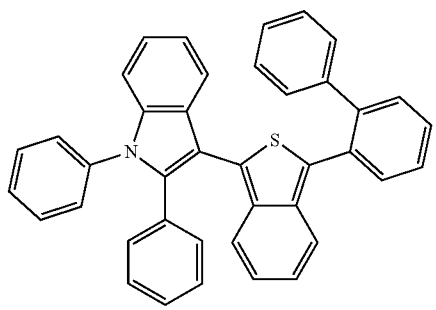
634
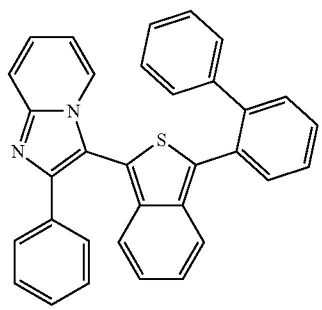
635
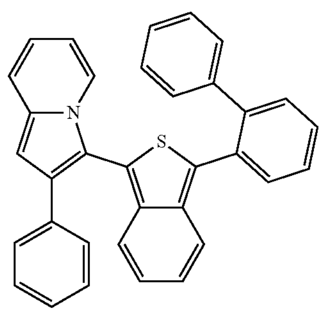
636
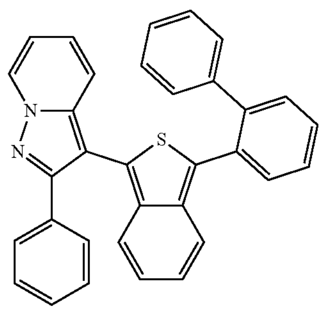
-continued
637
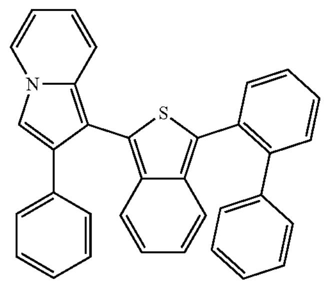
638
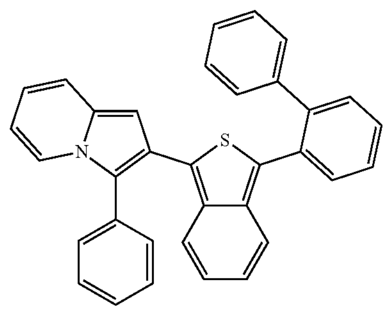
639
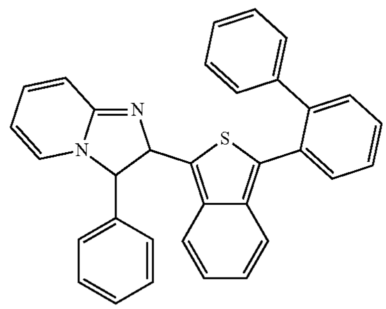
640
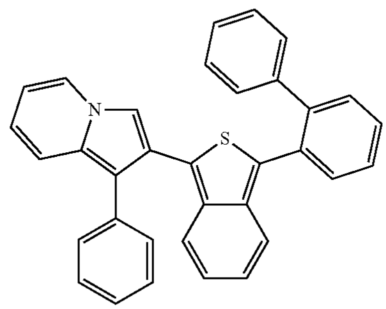
641
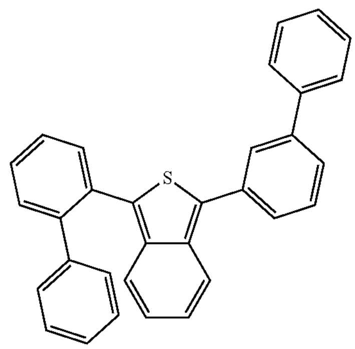

-continued
642
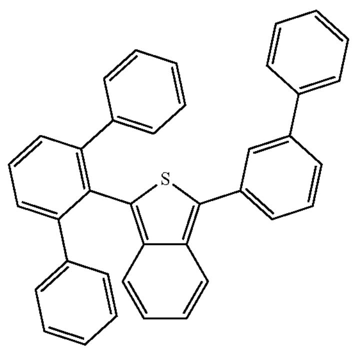
643
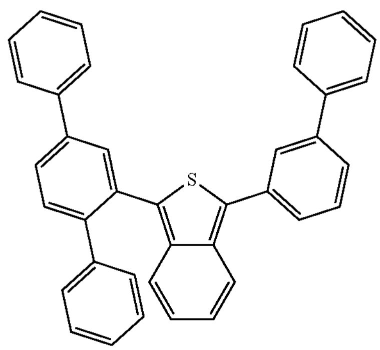
644
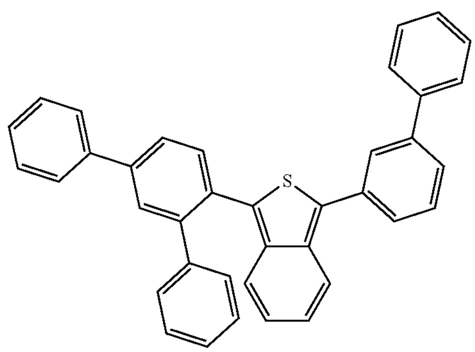
645
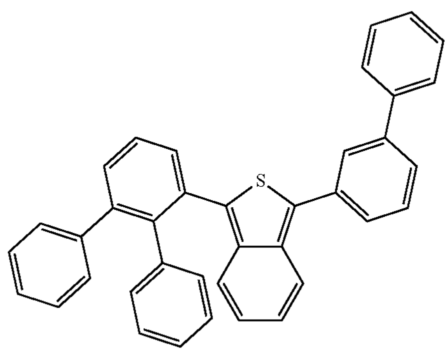
-continued
646
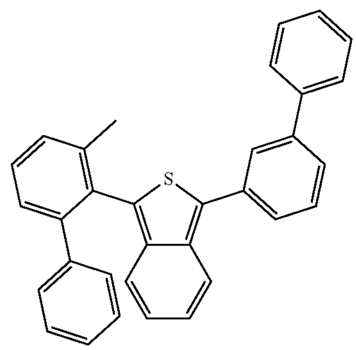
647
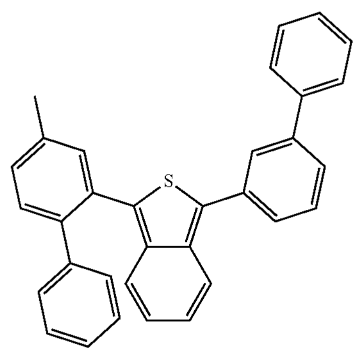
648
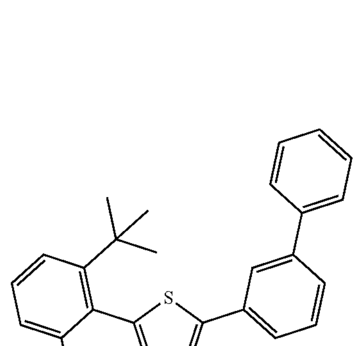
649
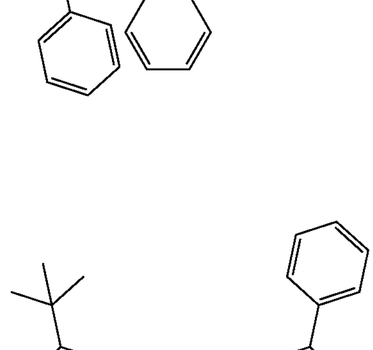
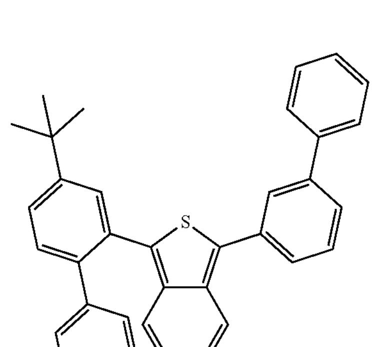

-continued
650
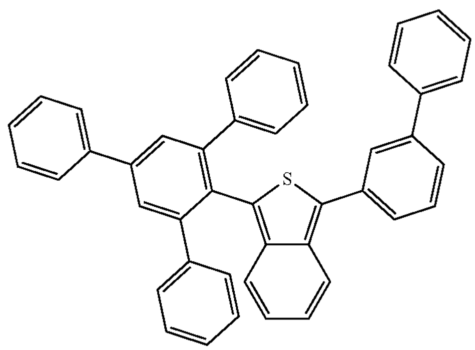
651
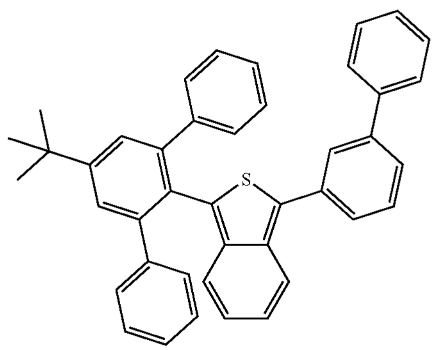
652
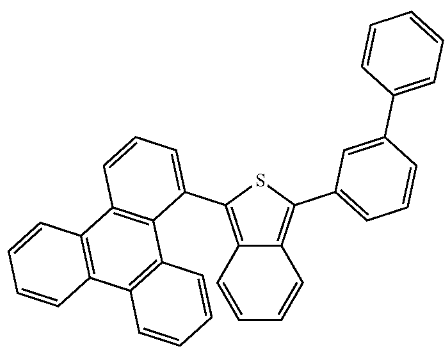
653
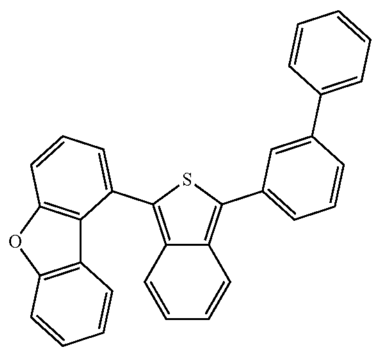
-continued
654
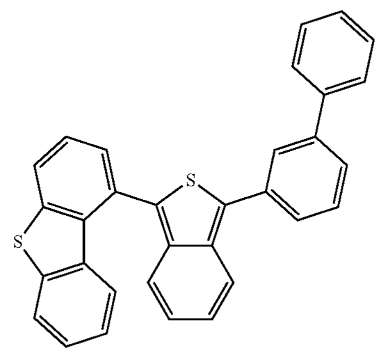
655
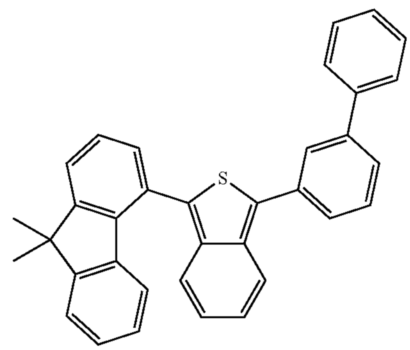
656
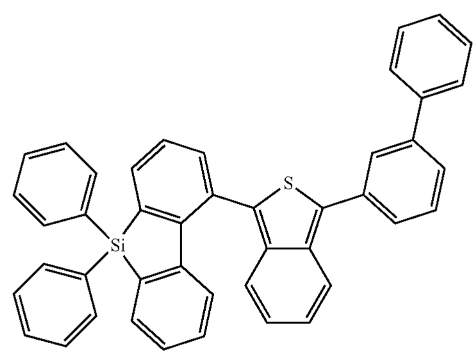
657
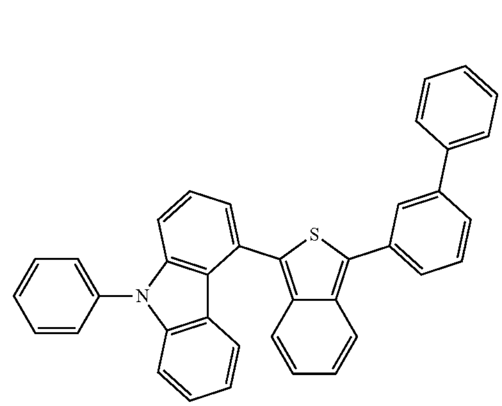

-continued
658
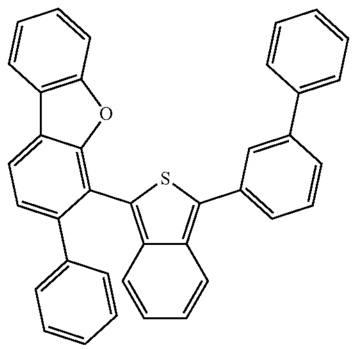
659
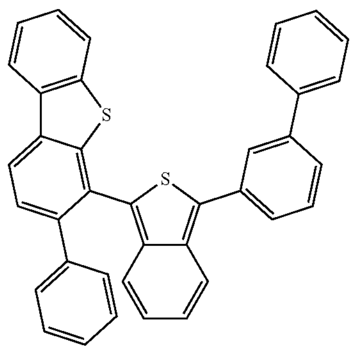
660
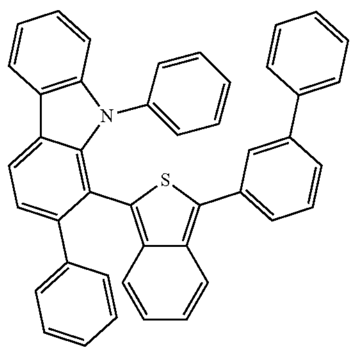
661
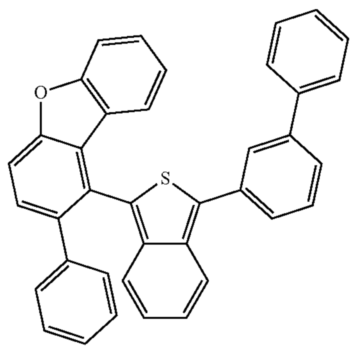
-continued
662
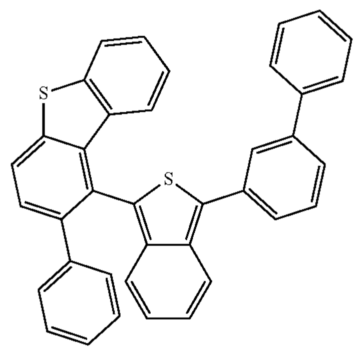
663
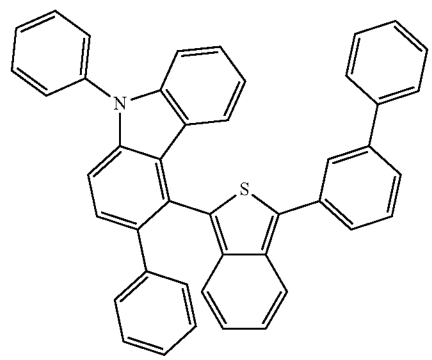
664
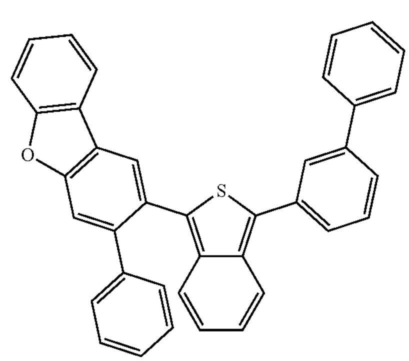
665
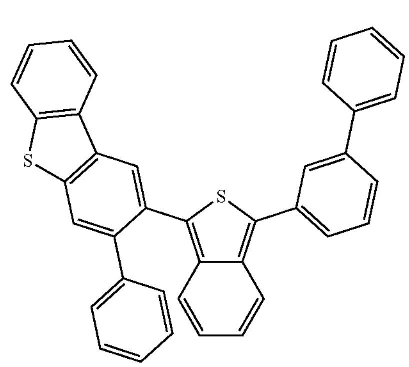

-continued
666
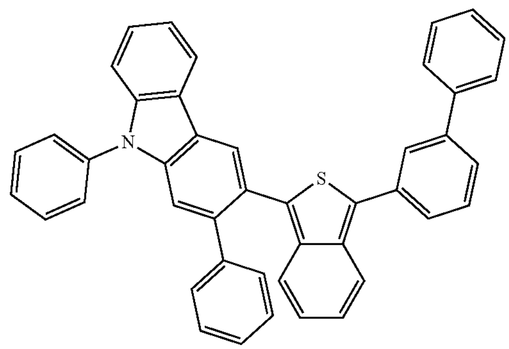
667
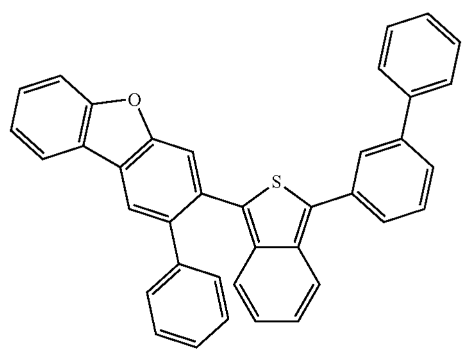
668
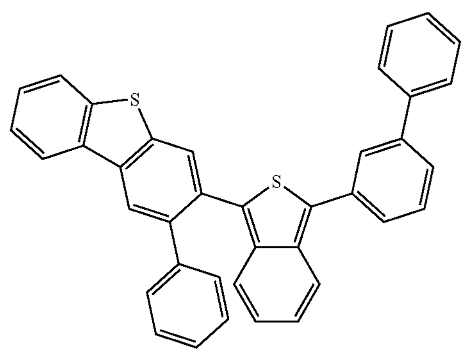
669
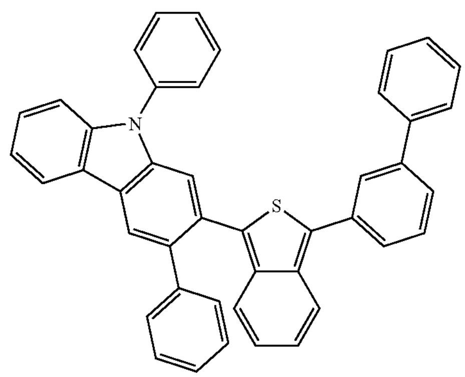
-continued
670
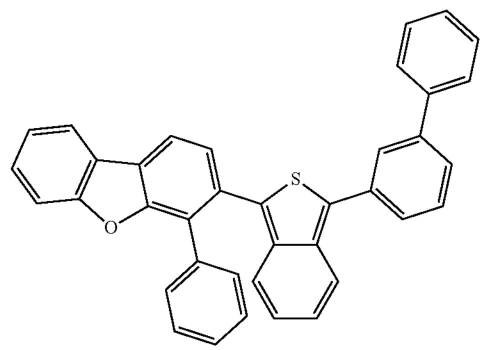
671
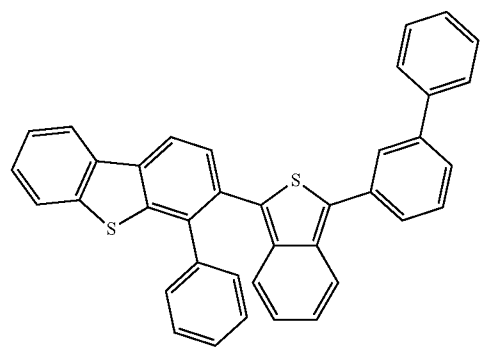
672
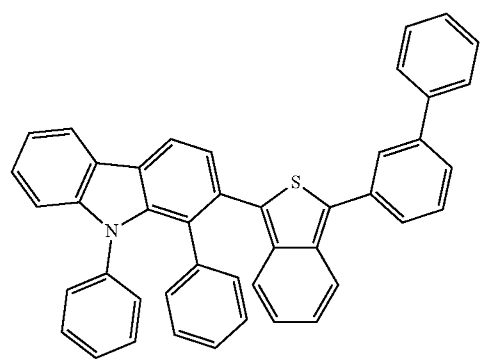
673
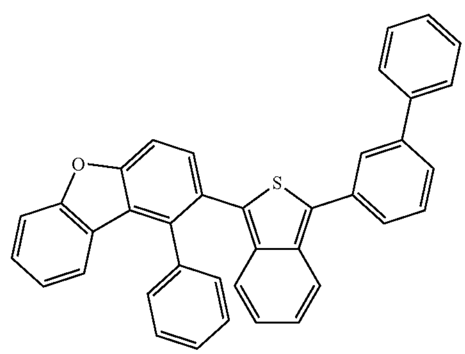

-continued
674
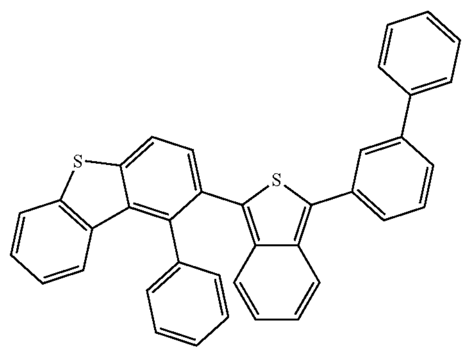
675
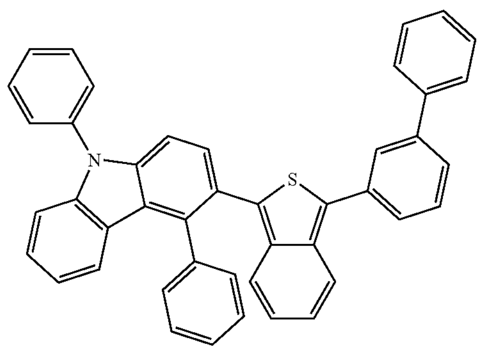
676
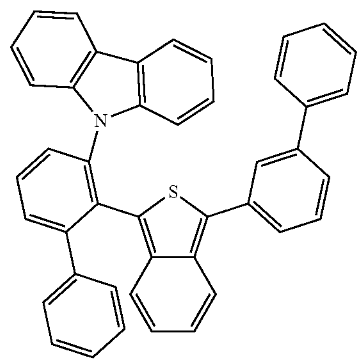
677
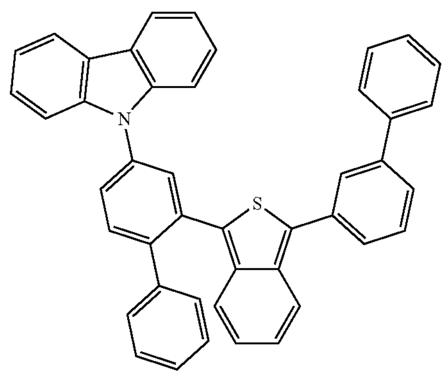
-continued
678
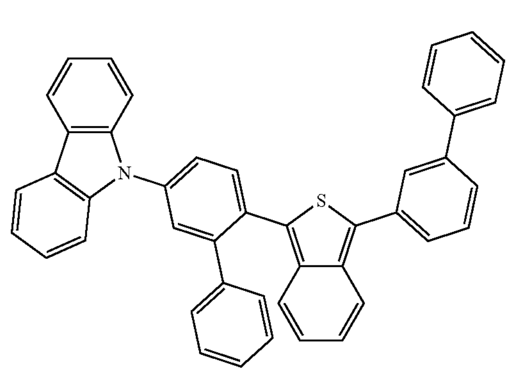
679
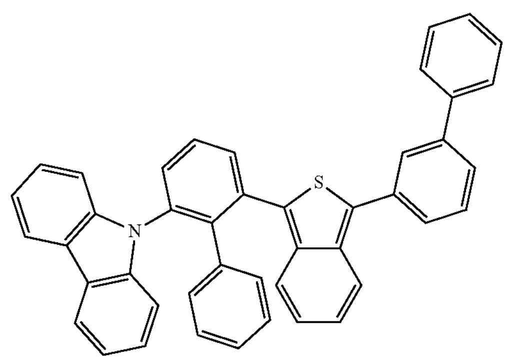
680
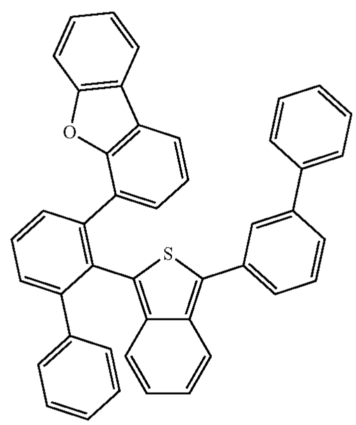
681
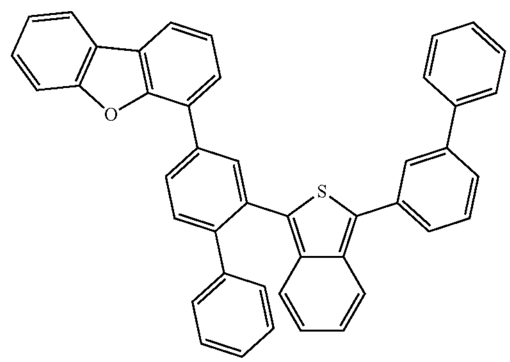

682
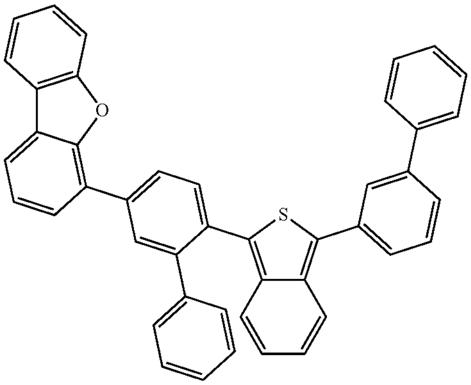
683
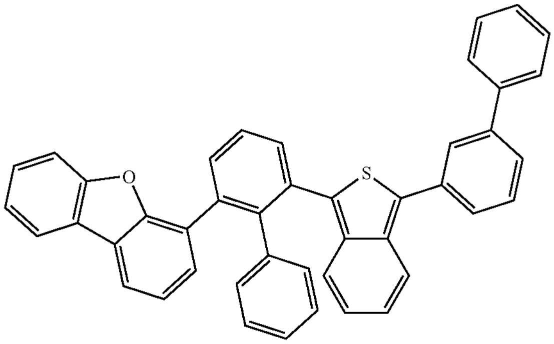
684
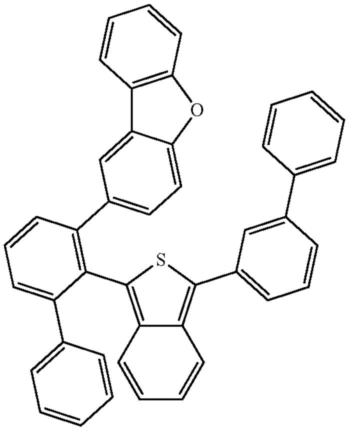
685
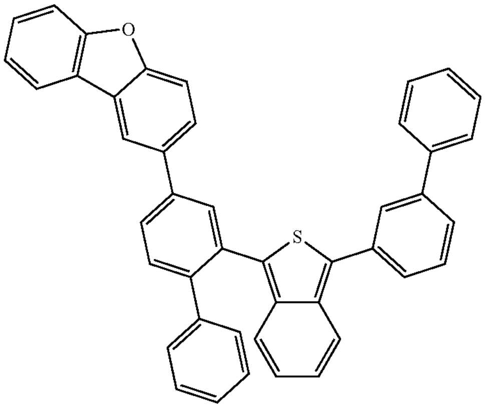
686
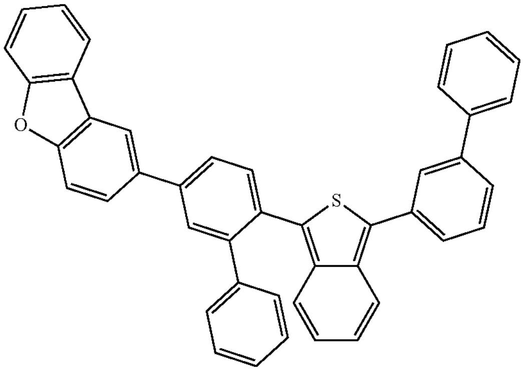
687
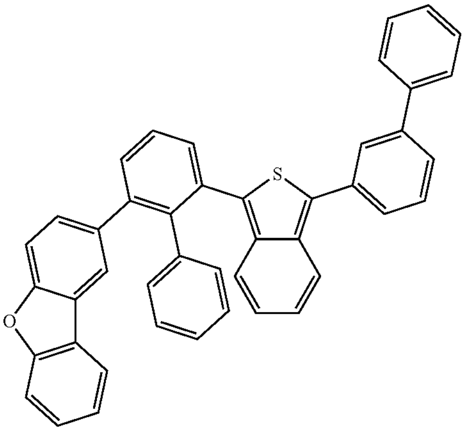
688
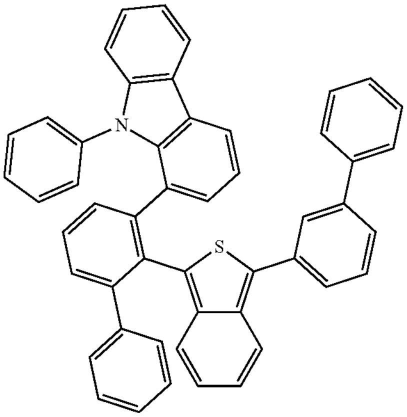

-continued
689
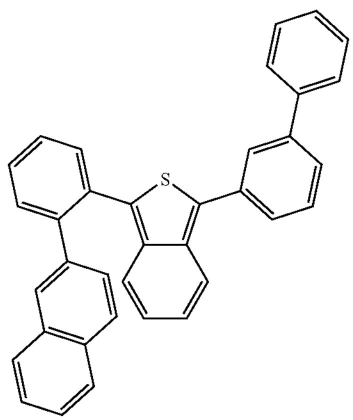
690
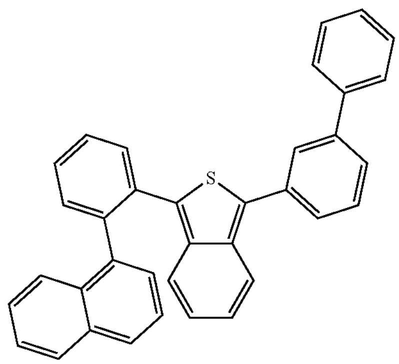
691
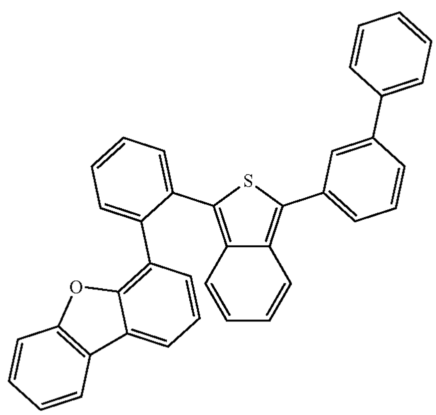
692
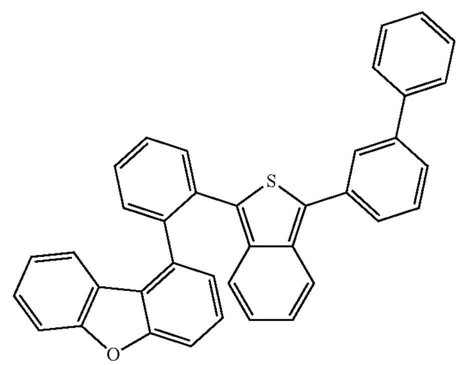
-continued
693
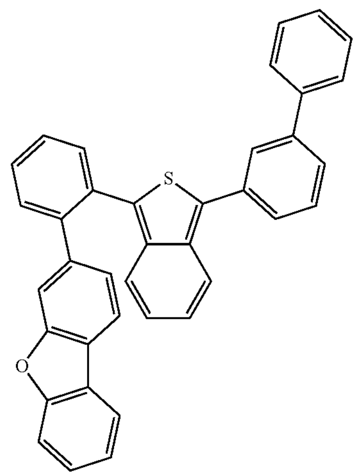
694
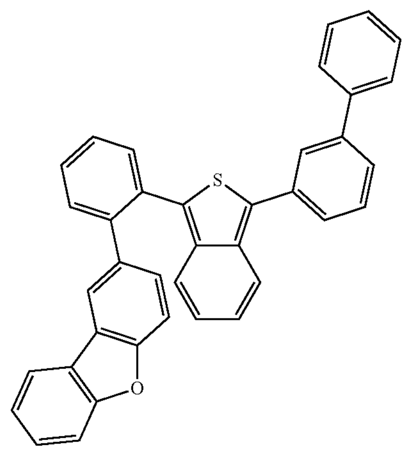
695
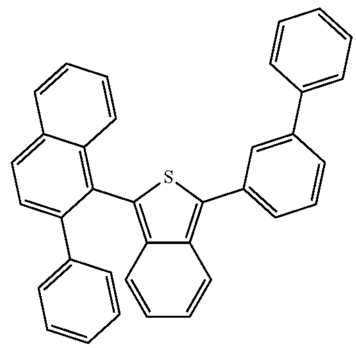
696
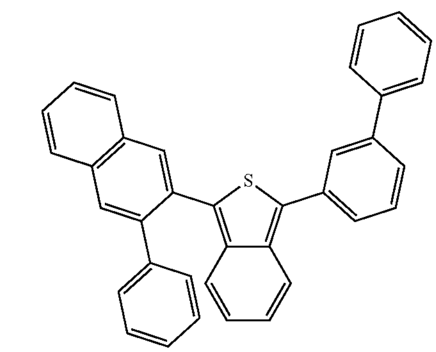

-continued
697
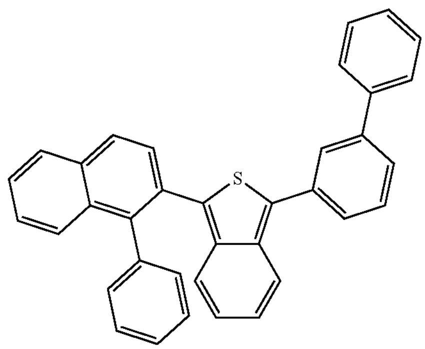
698
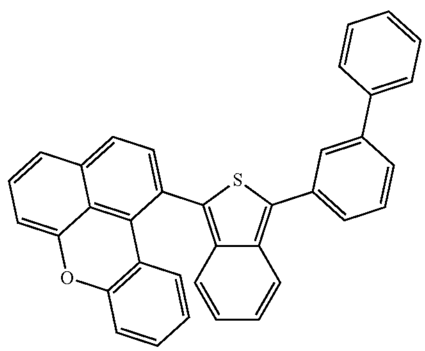
699
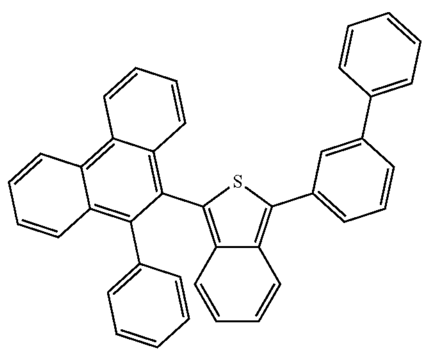
700
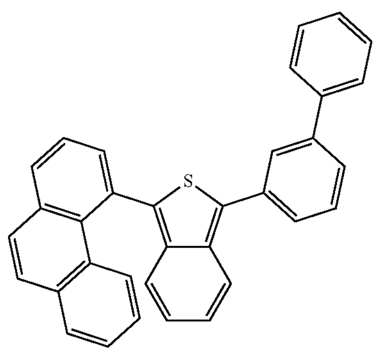
701
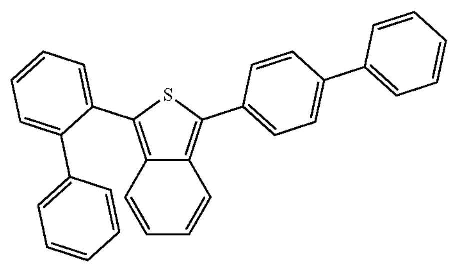
702
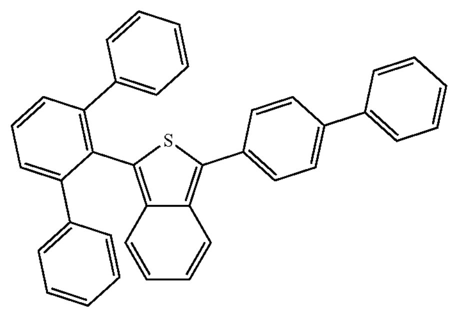
703
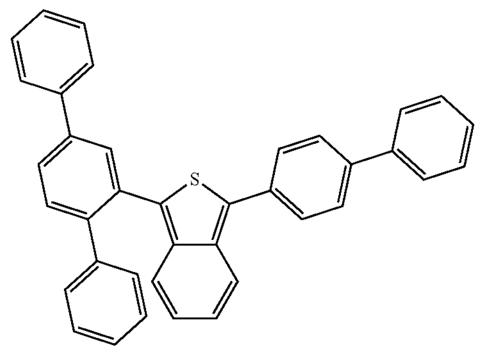
704
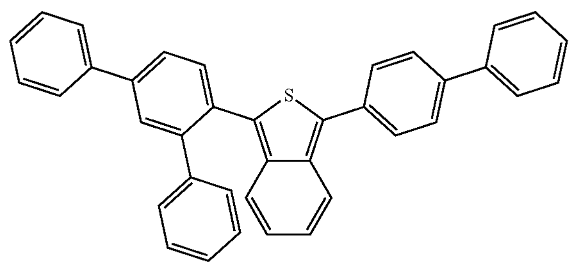
705
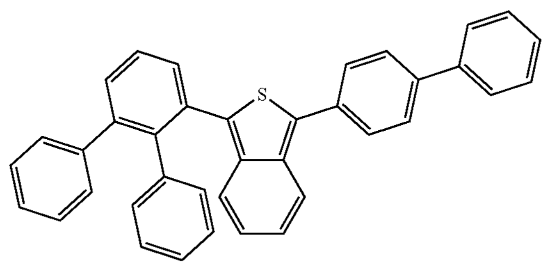

-continued
706
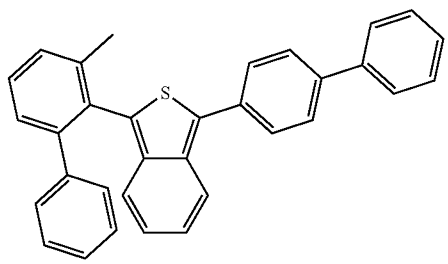
707
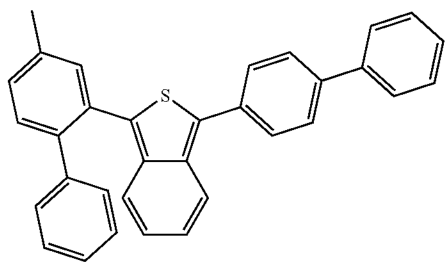
708
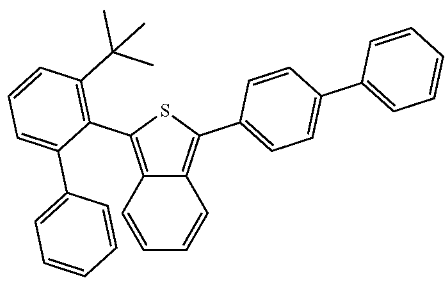
709
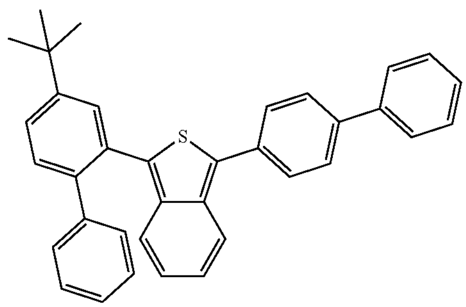
710
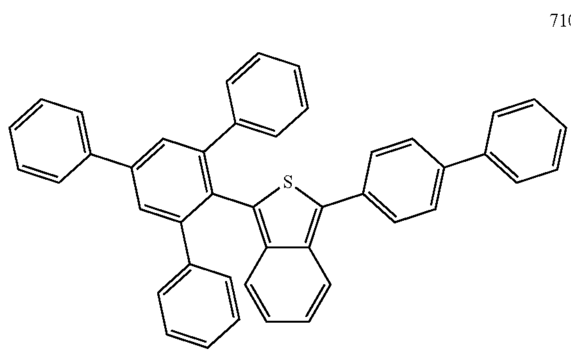 [SMILES: c1ccc(-c2ccc(-c3oc(-c4c(-c5ccccc5)cc(-c5ccccc5)cc4-c4ccccc4)c4ccccc34)cc2)cc1]
-continued
711
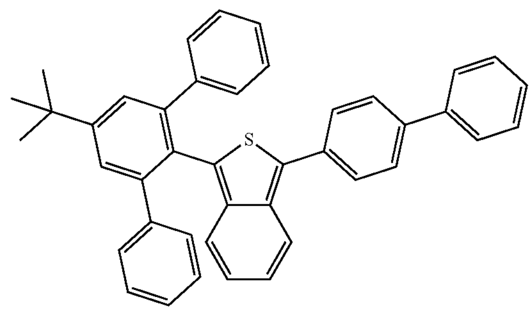
712
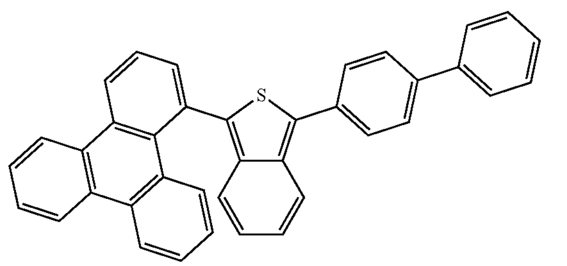
713
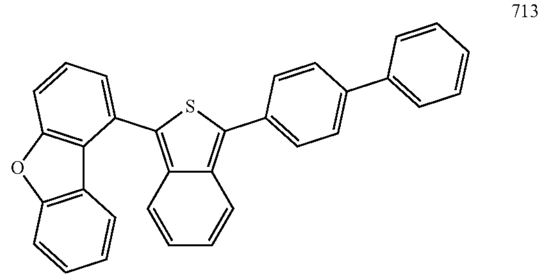
714
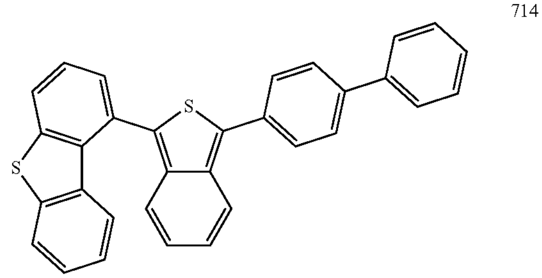
715
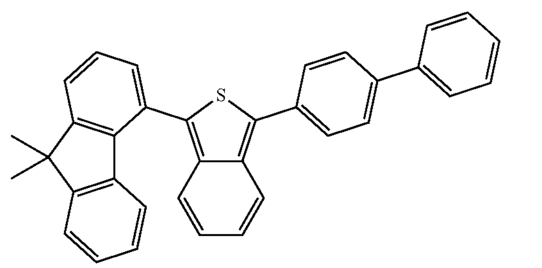

-continued
716
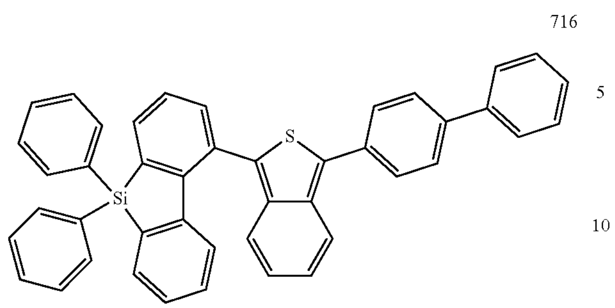
717
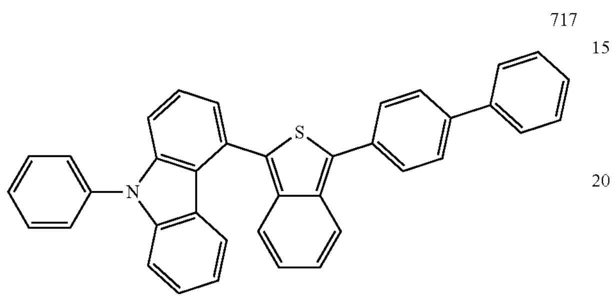
718
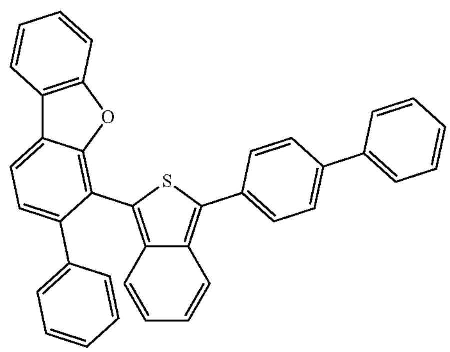
719
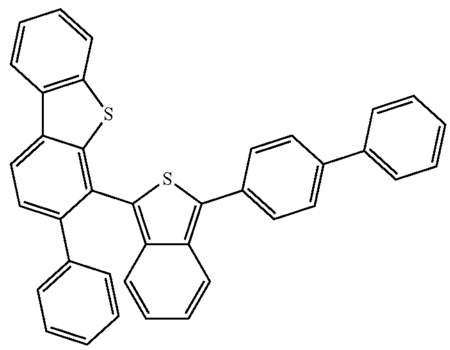
720
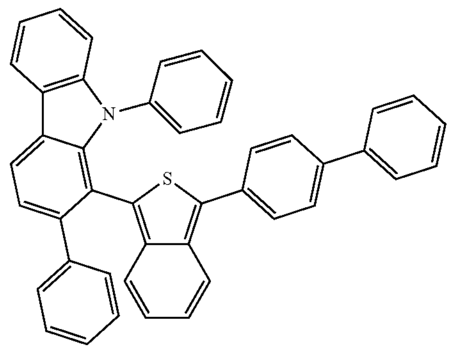
-continued
721
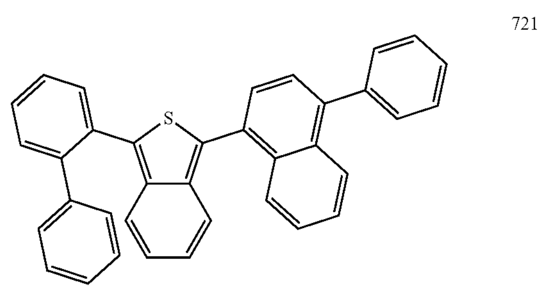
722
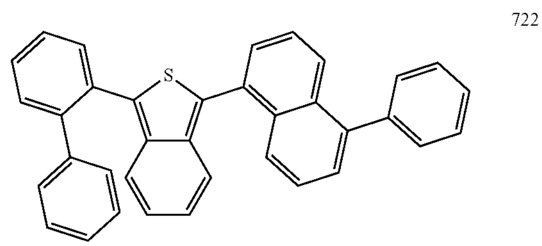
723
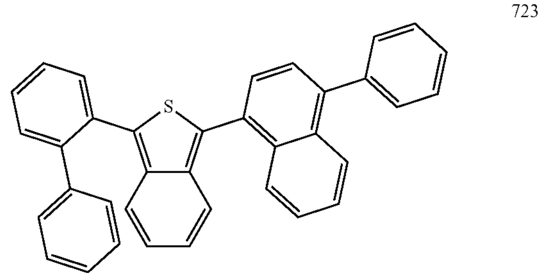
724
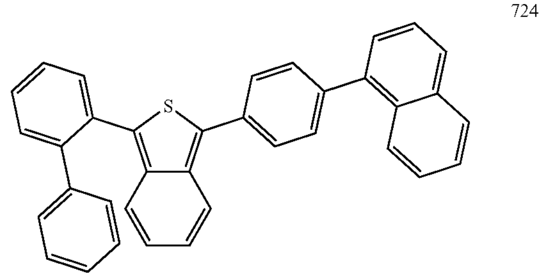 [SMILES: c1ccc(-c2ccc(-c3oc(-c4ccccc4-c4ccccc4)c4ccccc34)cn2)cc1]
725
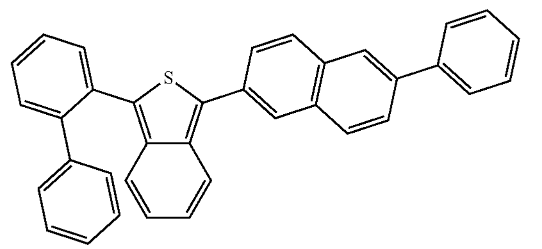
726
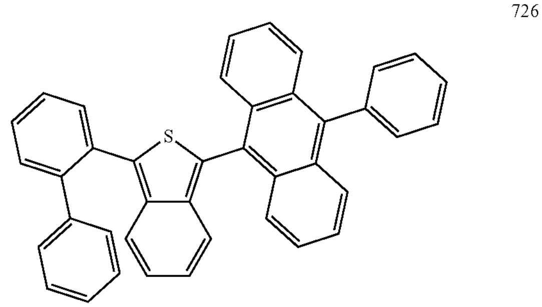

-continued
727
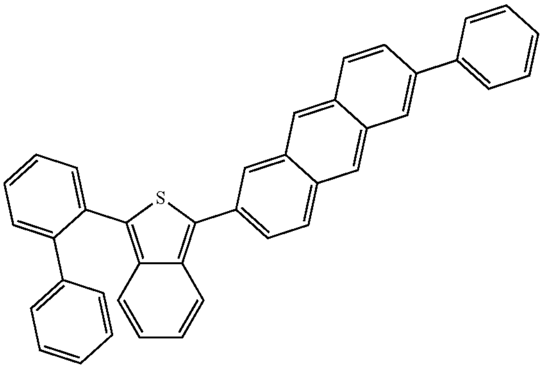
728
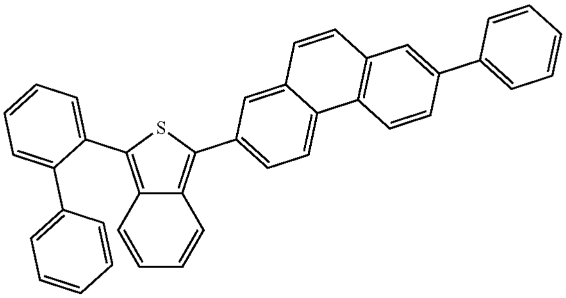
729
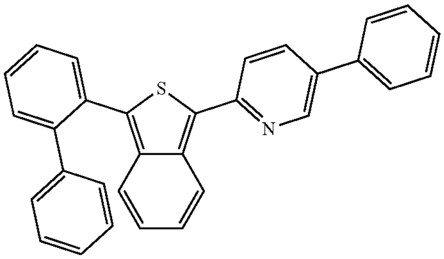
730
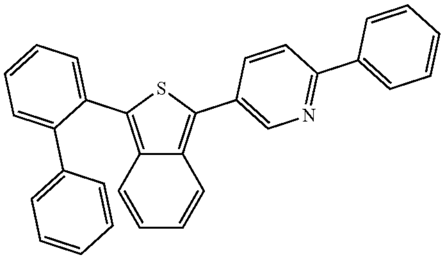
731
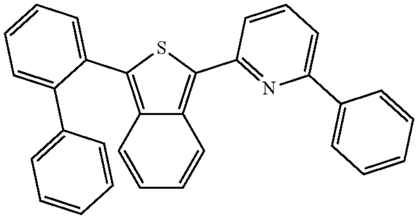
-continued
732
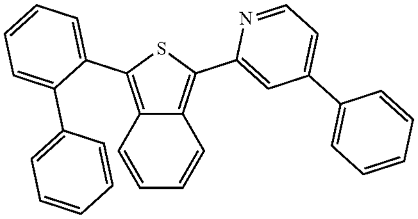
733
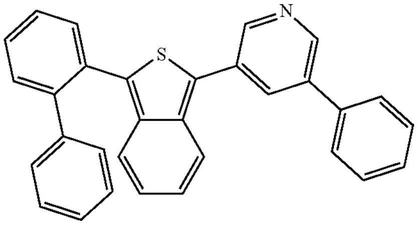
734
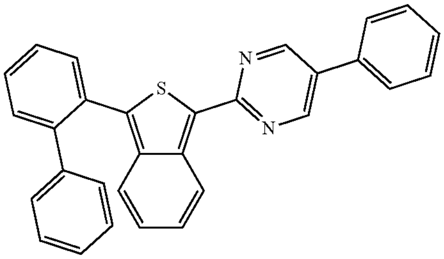
735
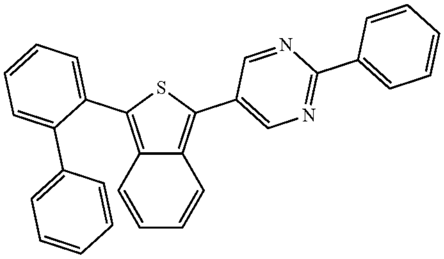
736
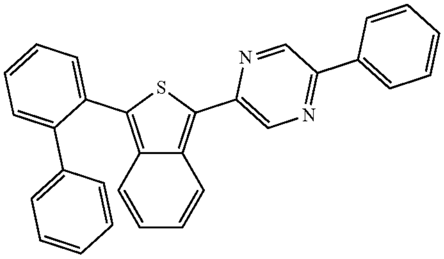
737
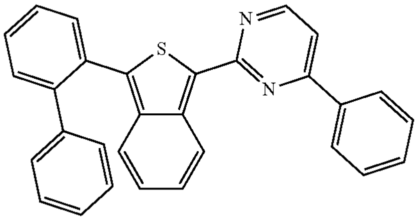

738
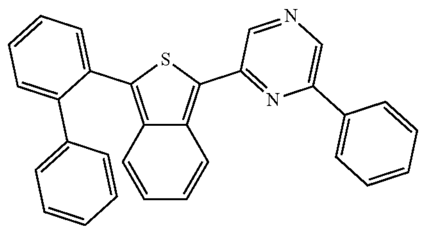
739
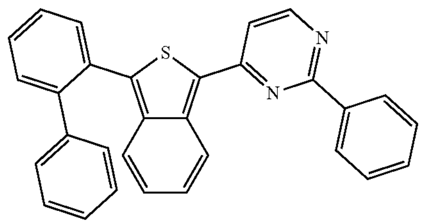
740
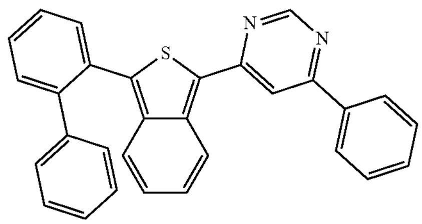
741
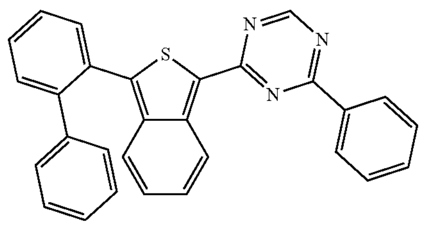
742
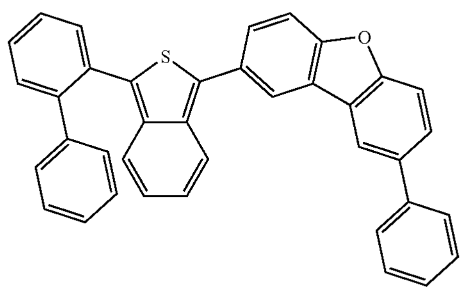
743
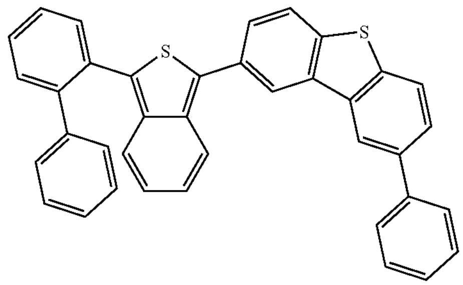
744
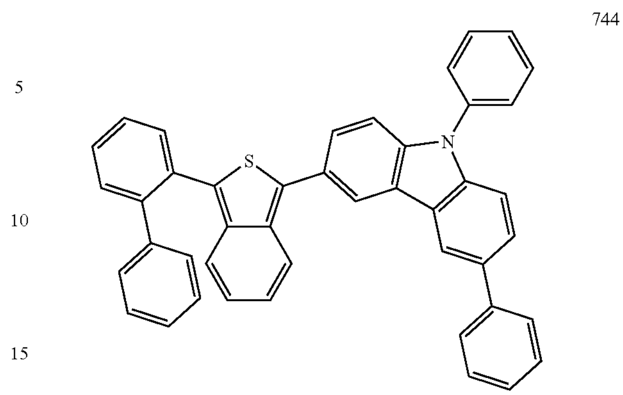
745
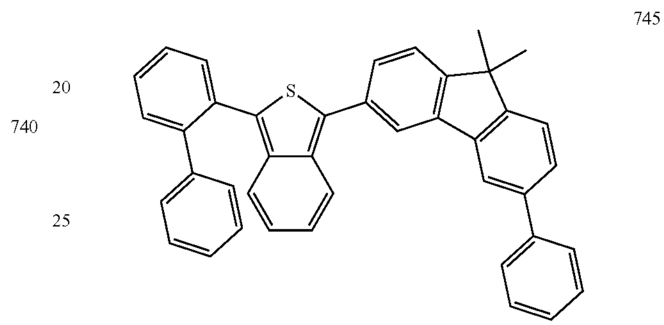
746
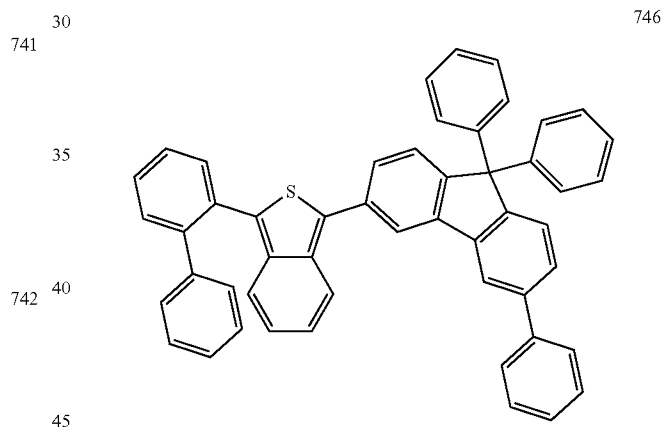
747
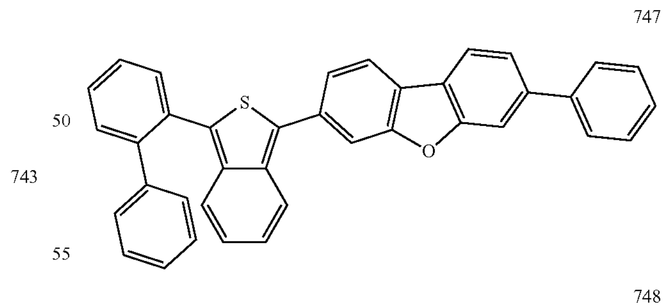
748
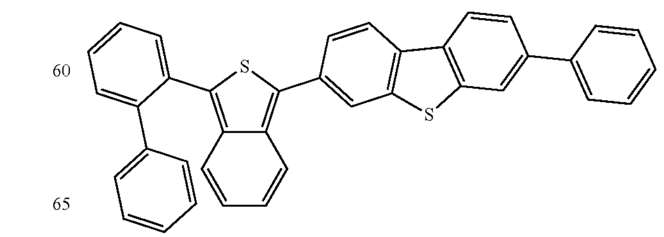

-continued
749
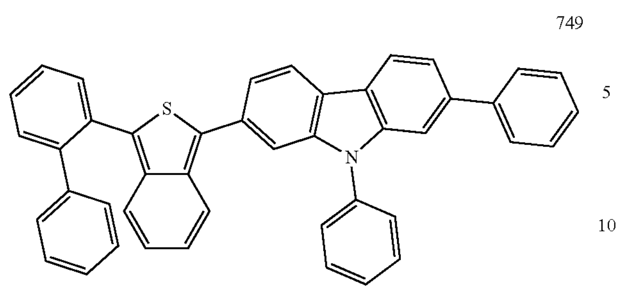
750
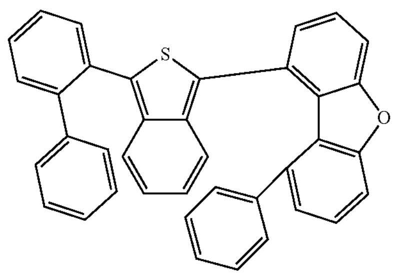
751
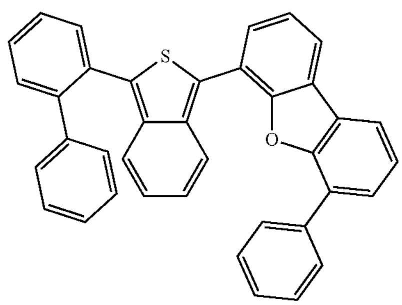
752
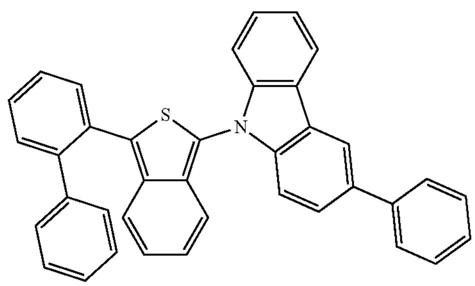
753
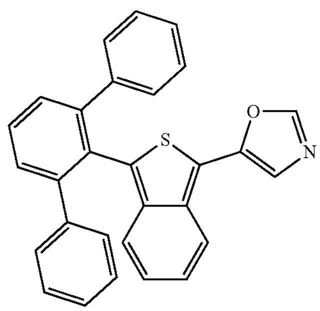
-continued
754
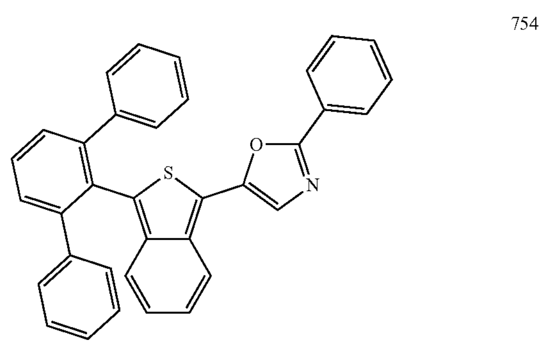
755
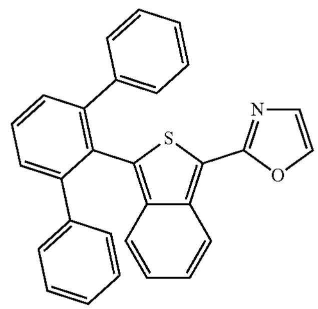
756
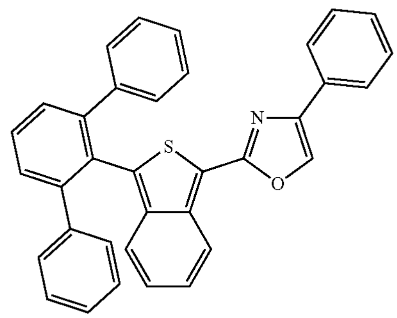
757
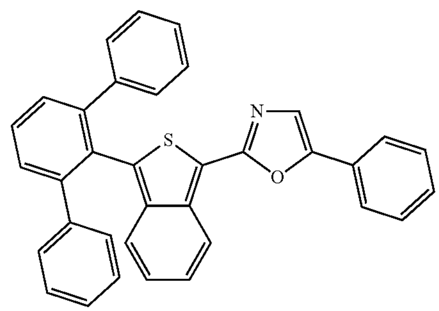
758
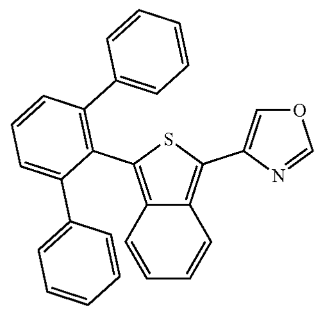

759
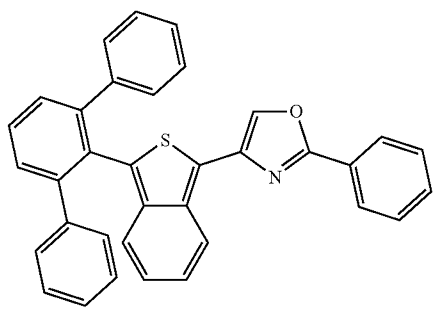
760
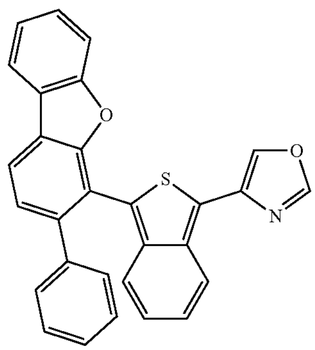
761
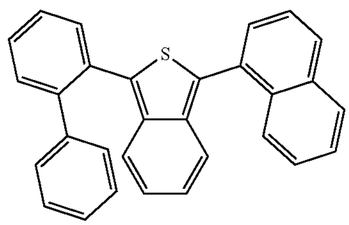
762
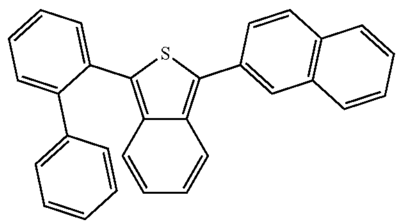
763
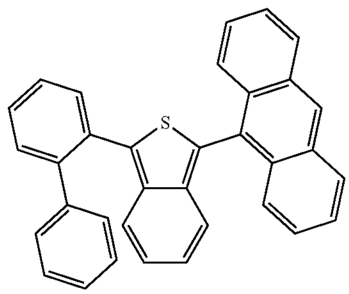
764
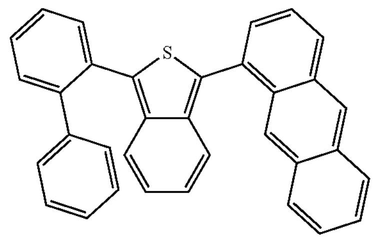
765
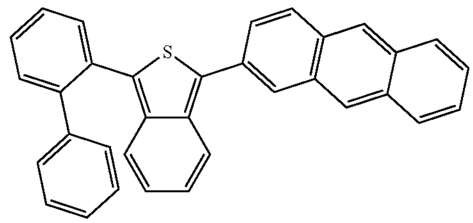
766
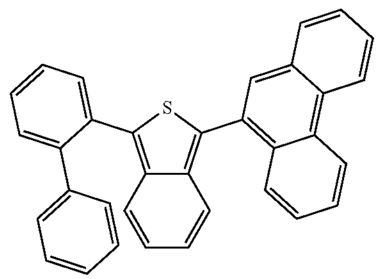
767
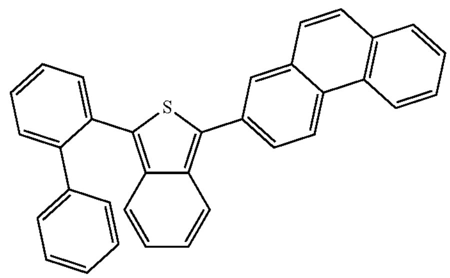
768
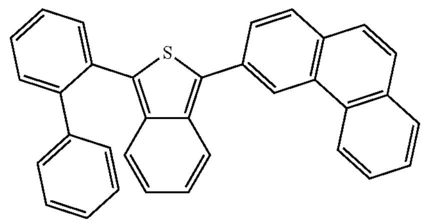
769
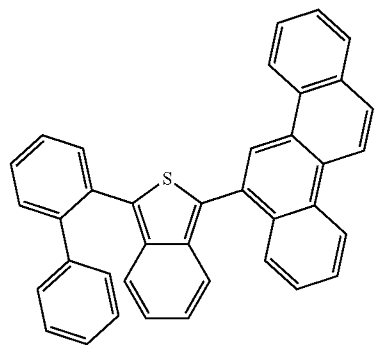

-continued
770
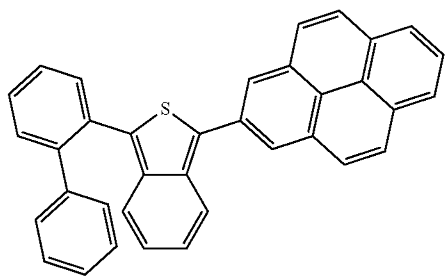
771
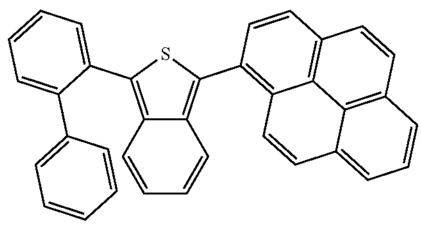
772
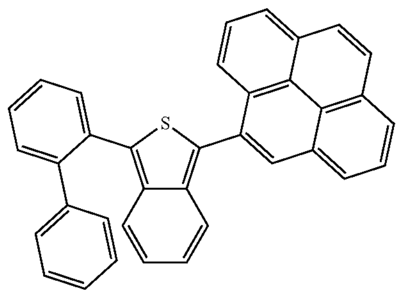
773
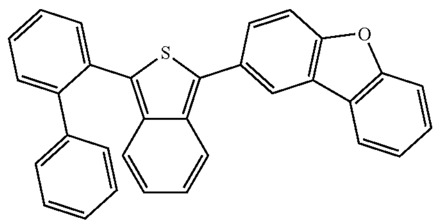
774
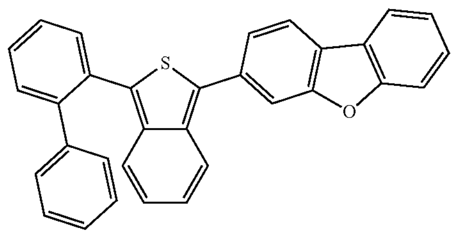
775
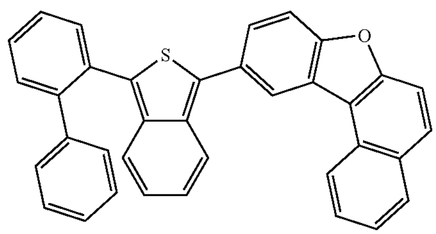
-continued
776
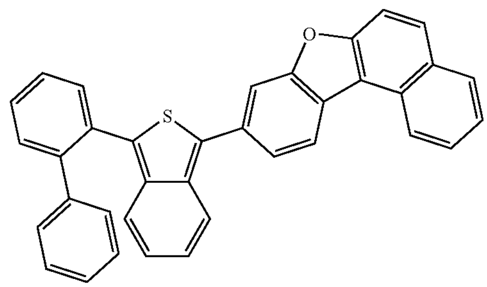
777
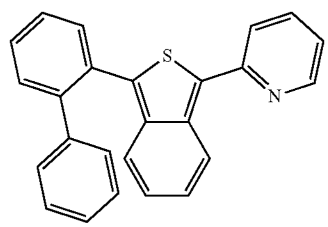
778
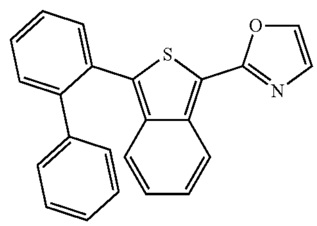
779
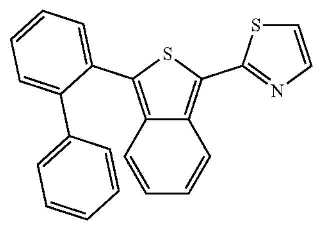
780
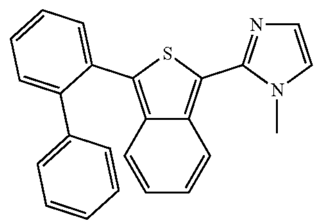
781
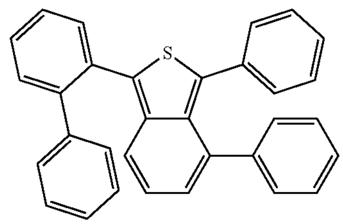

-continued
782
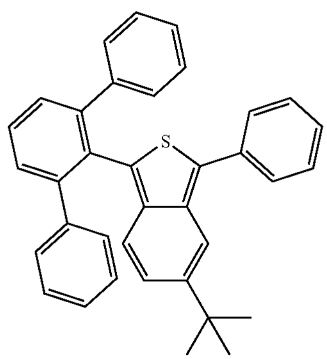
783
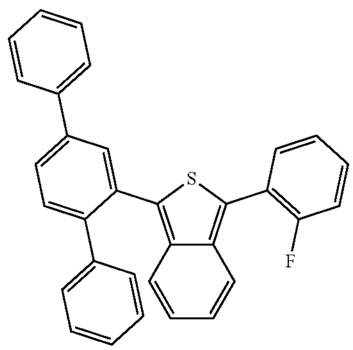
784
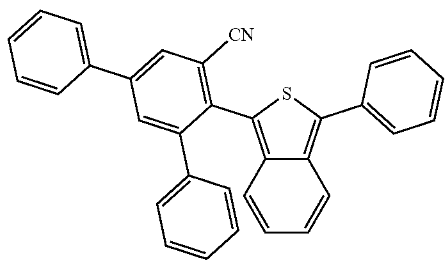
785
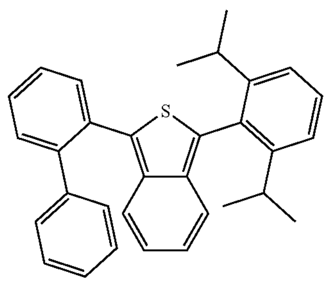
786
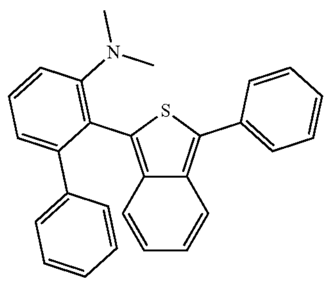
-continued
787
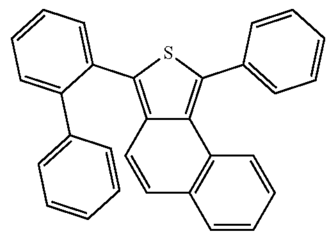
788
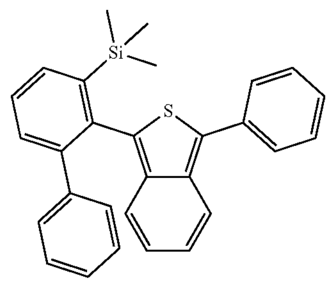
789
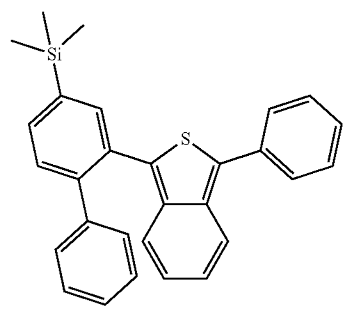
790
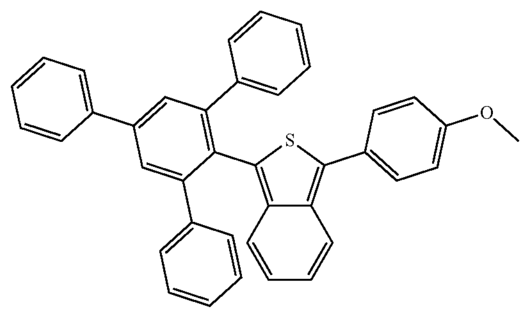
791
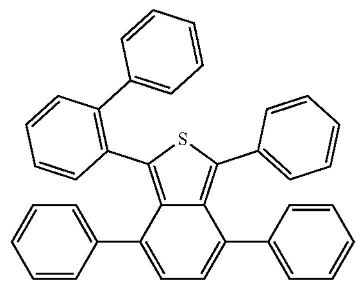

-continued
792
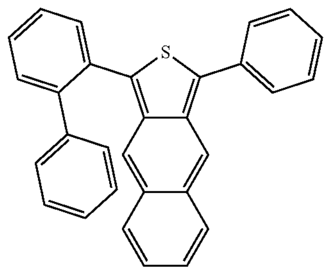
793
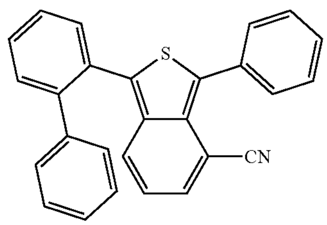
794
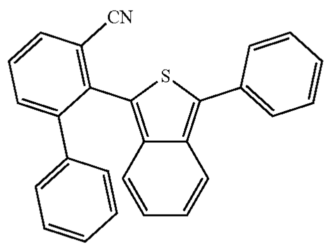
795
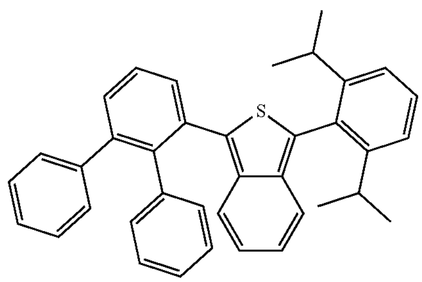
796
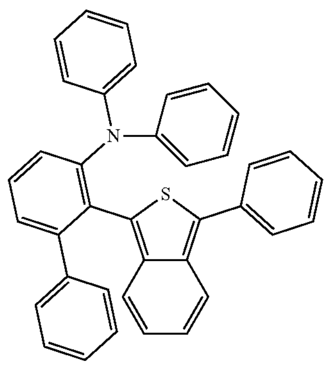
-continued
797
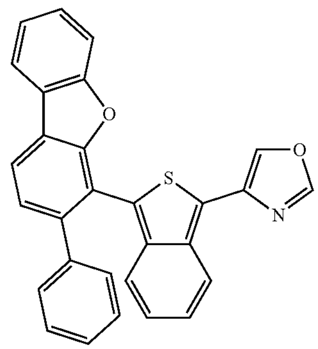
798
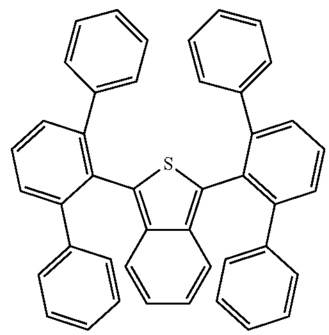
799
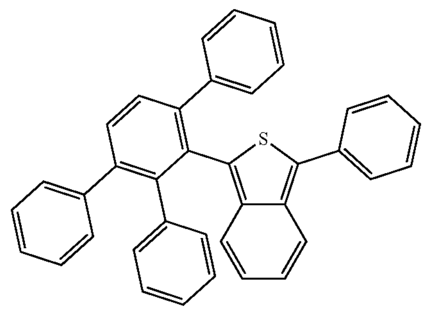
800
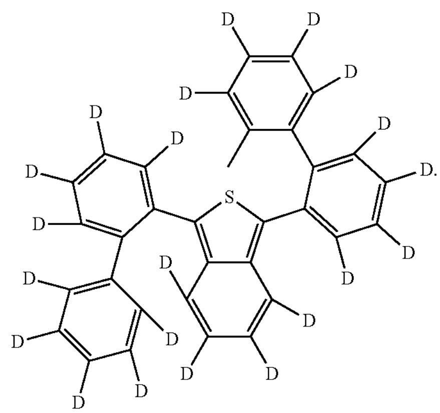
In one or more embodiments, the fluorescent host may be represented by Formula FH-3:

Formula FH-3

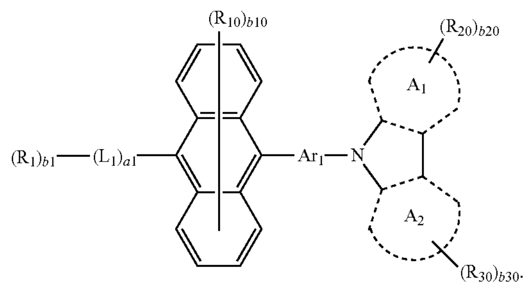

In Formula FH-3, $Ar_1$ may be a group represented by Formula 2:

Formula 2

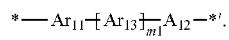

In Formula 2, $Ar_1$ may include at least one cyano group, $A_1$ and $A_2$ may each independently be a $C_5$-$C_{30}$ carbocyclic group or a $C_1$-$C_{30}$ heterocyclic group, $L_1$ may be an unsubstituted or substituted $C_5$-$C_{30}$ carbocyclic group or an unsubstituted or substituted $C_1$-$C_{30}$ heterocyclic group, a1 may be 0, 1, 2, or 3, when a1 is two or more, two or more of $L_1$ may be identical to or different from each other, m1 may be 0, 1, 2, or 3, and $Ar_{11}$ may be a group represented by Formula 4, $Ar_{12}$ may be a group represented by Formula 5, and $Ar_{13}$ may be a group represented by Formula 6:

Formula 4

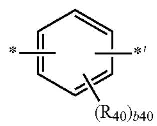

Formula 5

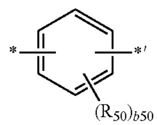

-continued

Formula 6

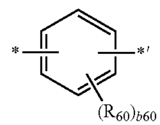

wherein, in the formulae above, $R_1$, $R_{10}$, $R_{20}$, $R_{30}$, $R_{40}$, $R_{50}$, and $R_{60}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$heteroaryloxy group, a substituted or unsubstituted $C_1$-$C_{60}$heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, b1 may be an integer from 1 to 5, when b1 is two or more, two or more of $R_1$ may be identical to or different from each other, b10 may be an integer from 1 to 8, when b10 is two or more, two or more of $R_{10}$ may be identical to or different from each other, b20 and b30 may each independently be an integer from 1 to 4, when b20 is 2 or more, two or more of $R_{20}$ may be identical to or different from each other, and when b30 is 2 or more, two or more of $R_{30}$ may be identical to or different from each other, b40, b50, and b60 may each independently be an integer from 1 to 4, when b40 is 2 or more, two or more of $R_{40}$ may be identical to or different from each other, when b50 is 2 or more, two or more of $R_{50}$ may be identical to or different from each other, and when b60 is 2 or more, two or more of $R_{60}$ may be identical to or different from each other, and

* and *' each indicate a binding site to a neighboring atom.

In one or more embodiments, the fluorescent host represented by Formula FH-3 may be a compound of Group FH3, embodiments of the present disclosure are not limited thereto:

1
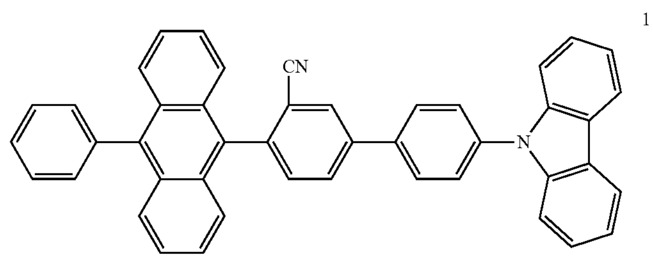
2
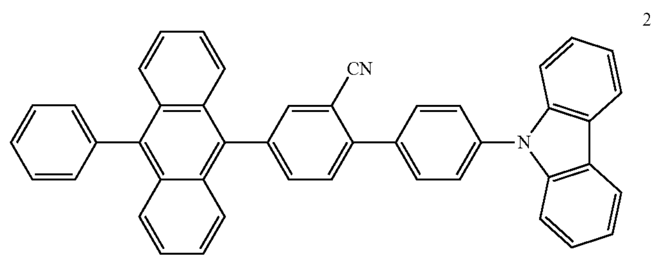
3
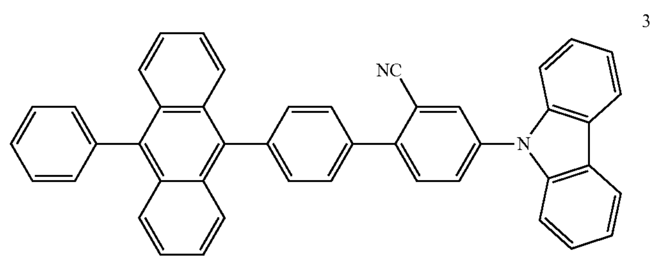
4
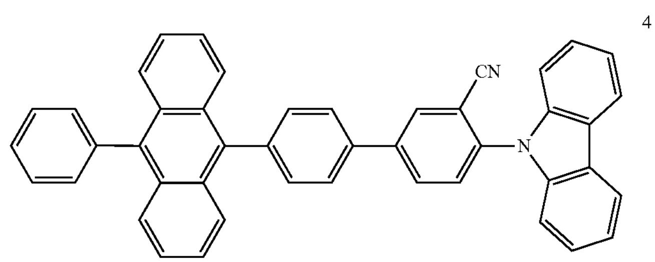
5
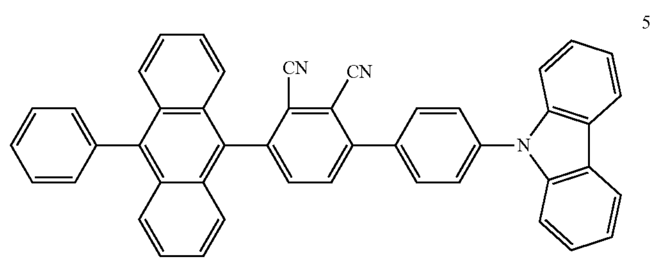
6
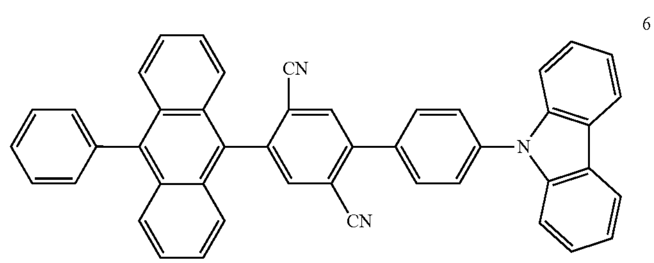

-continued
7
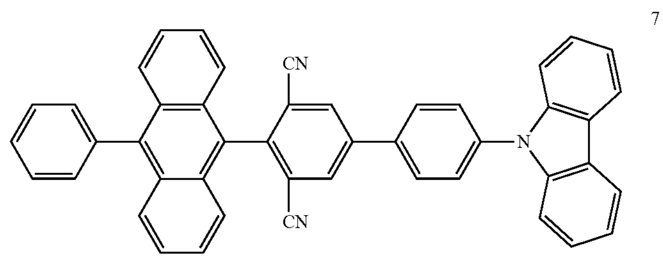
8
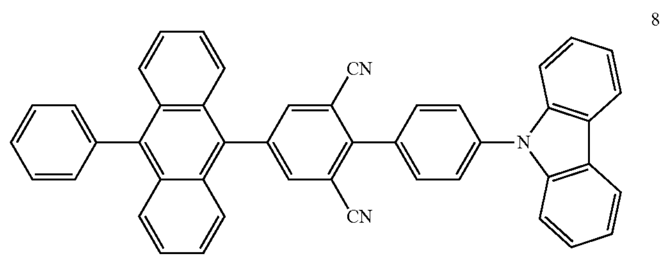
9
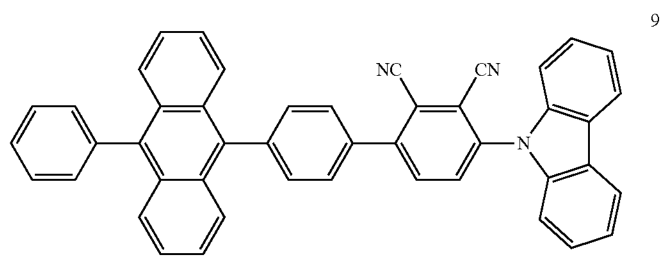
10
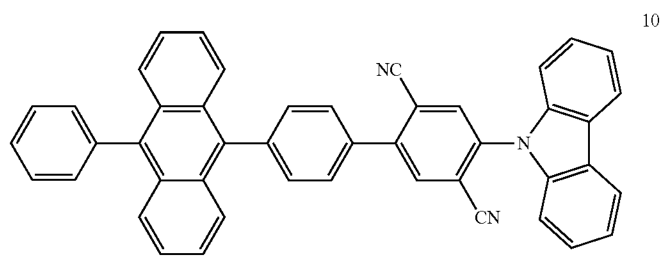
11
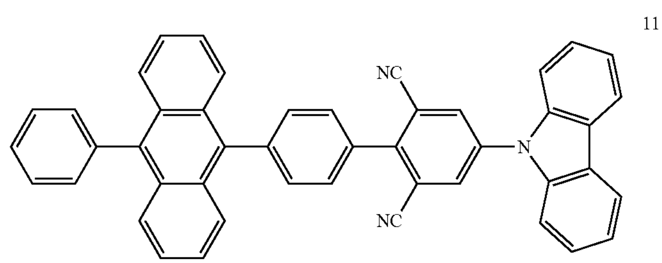
12
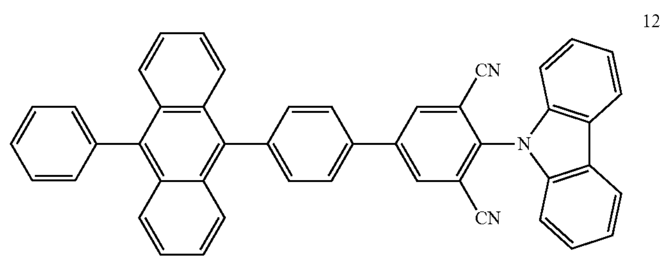

-continued
13
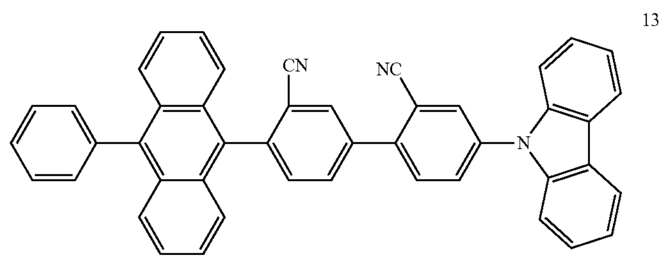
14
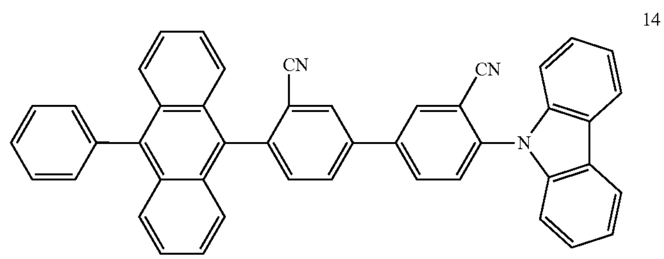
15
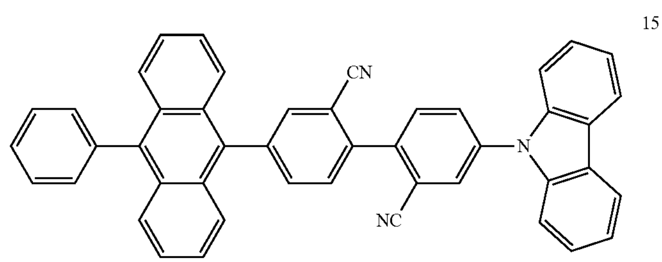
16
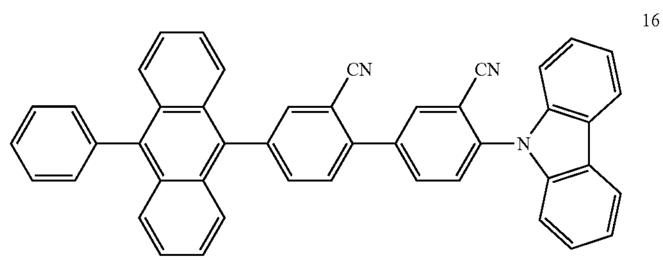
17
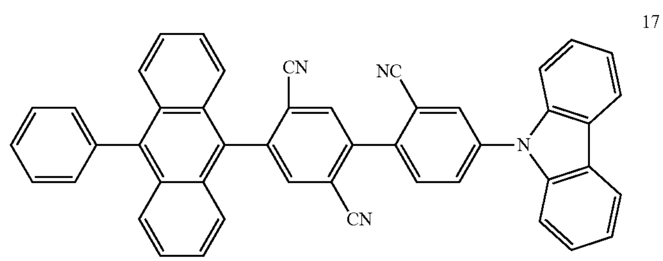
18
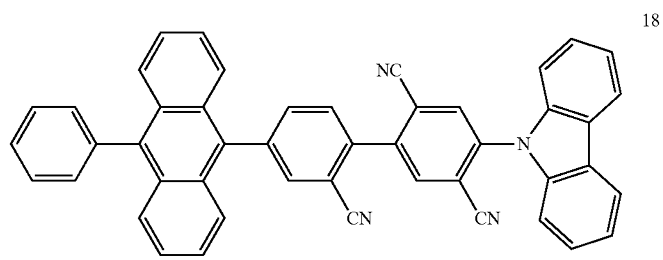

-continued
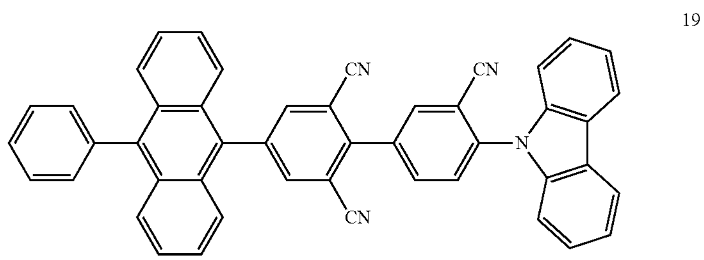
19
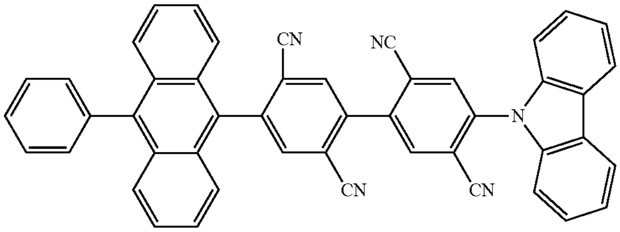
20
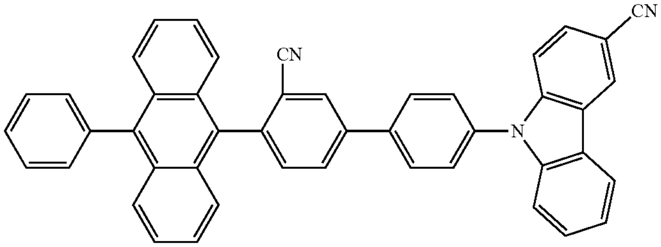
21
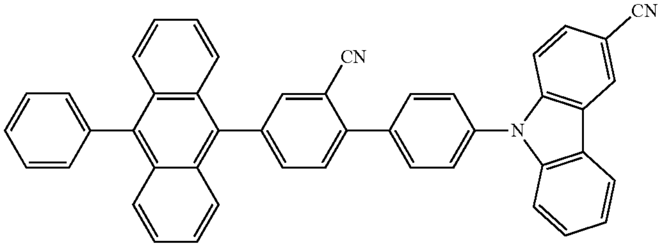
22
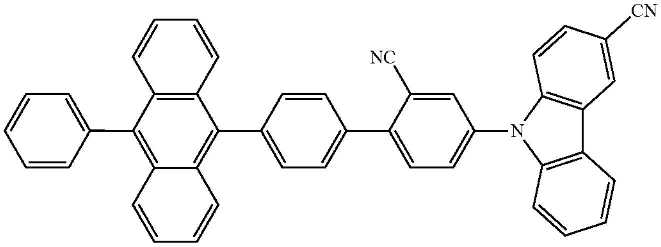
23
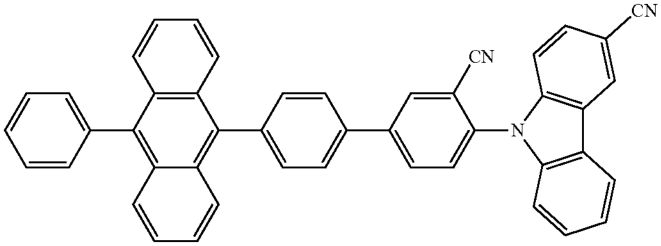
24

-continued
25
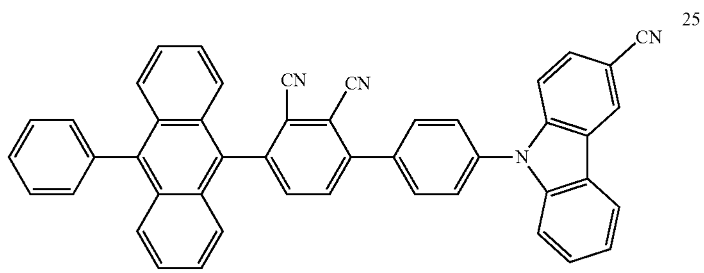
26
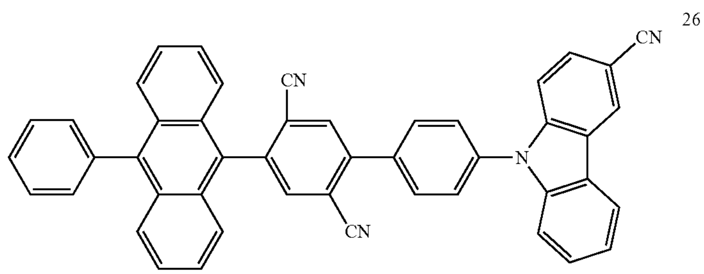
27
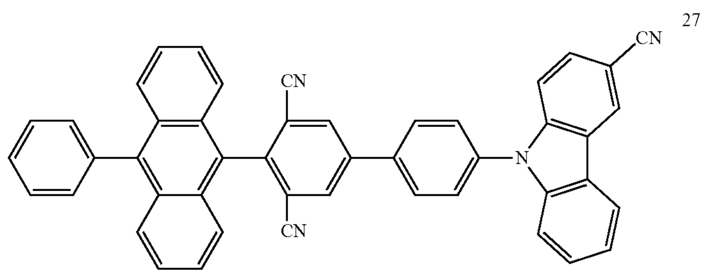
28
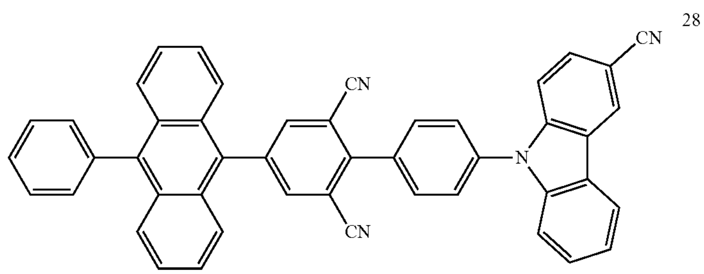
29
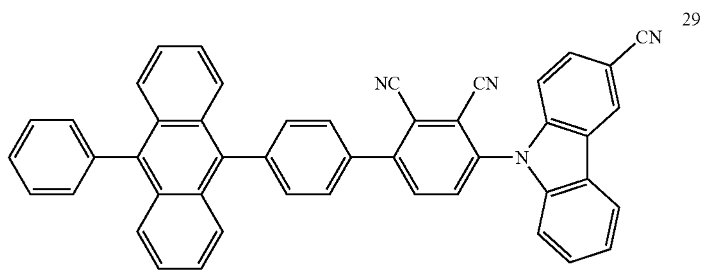
30
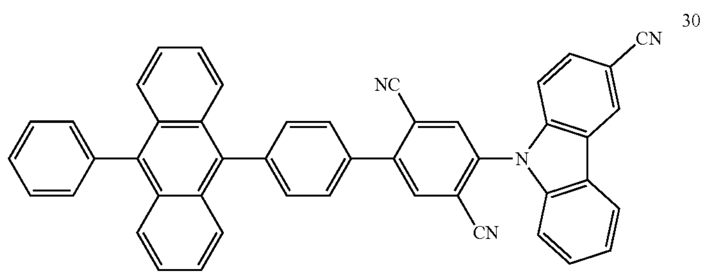

-continued
31
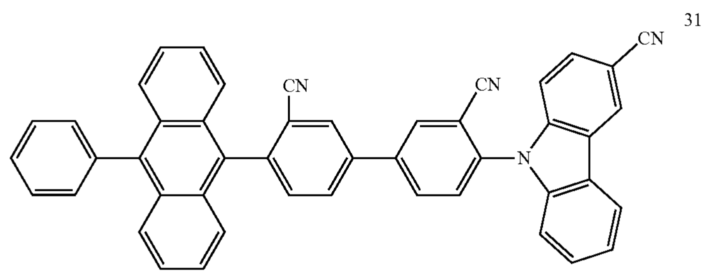
32
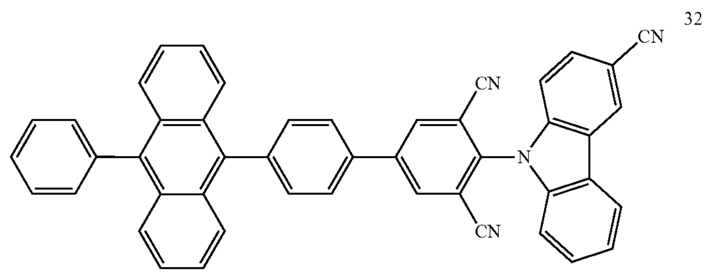
33
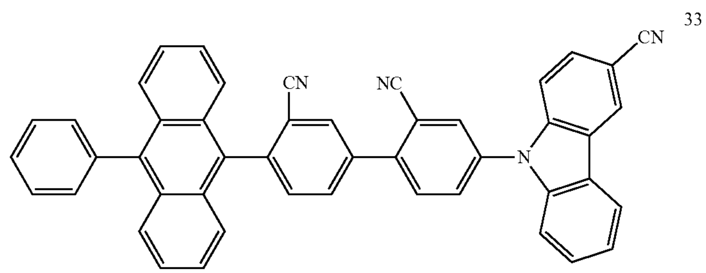
34
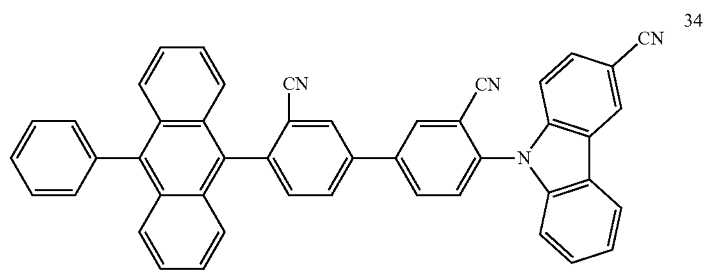
35
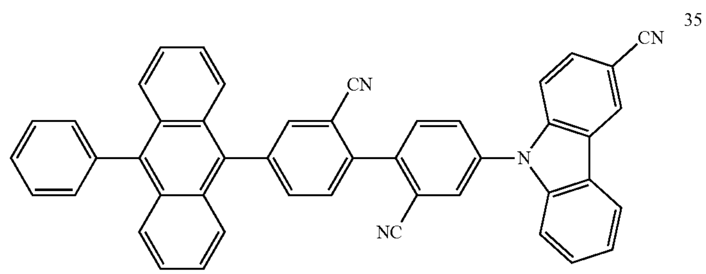
36
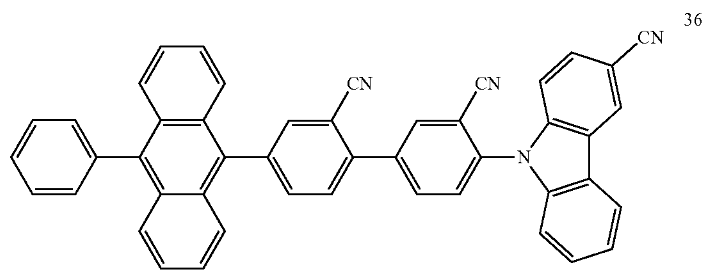

-continued
37
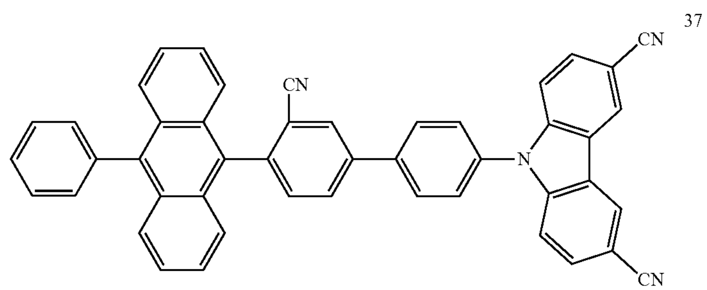
38
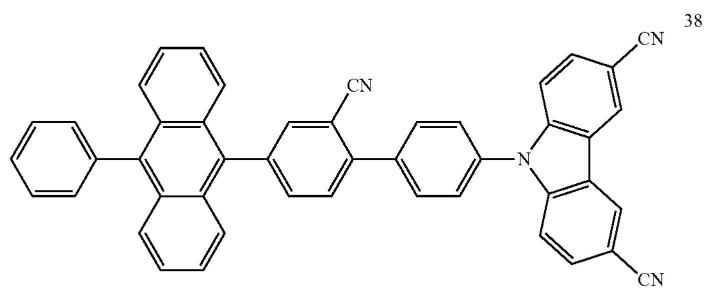
39
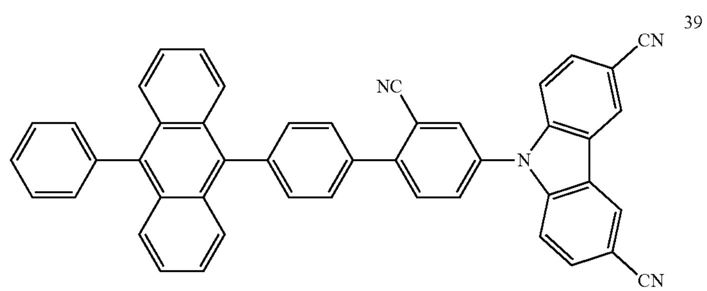
40
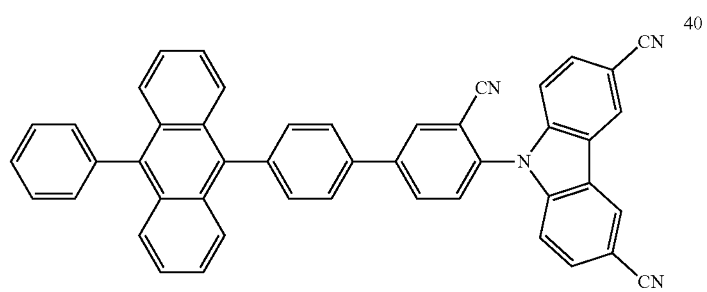
41
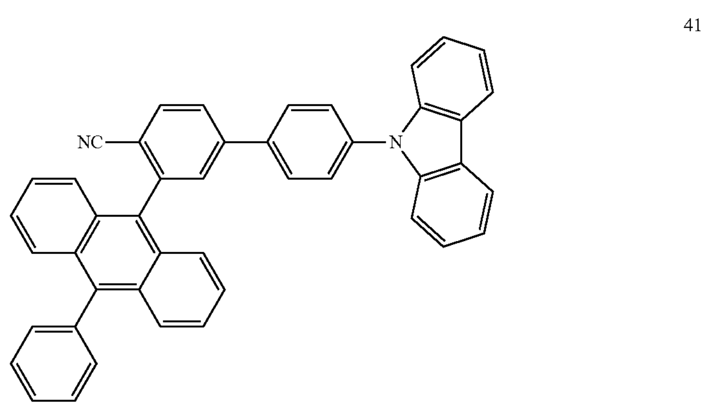

-continued
42
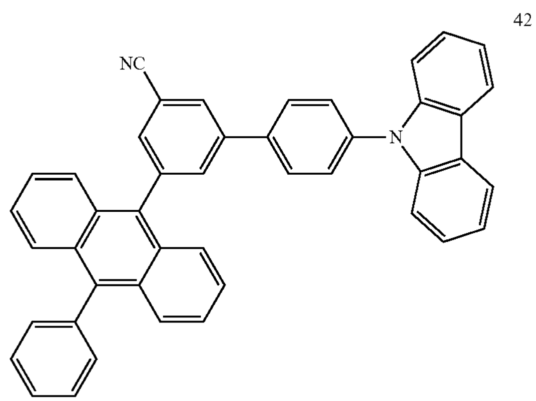
43
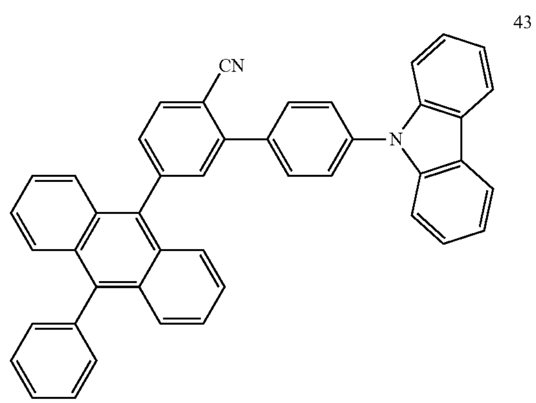
44
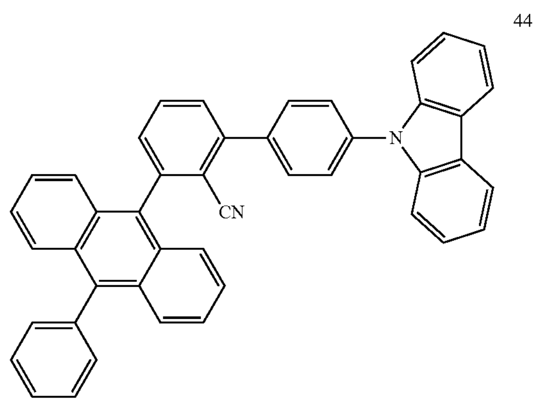
45
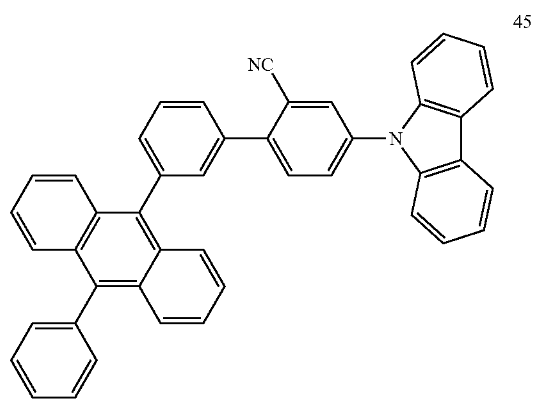

-continued
46
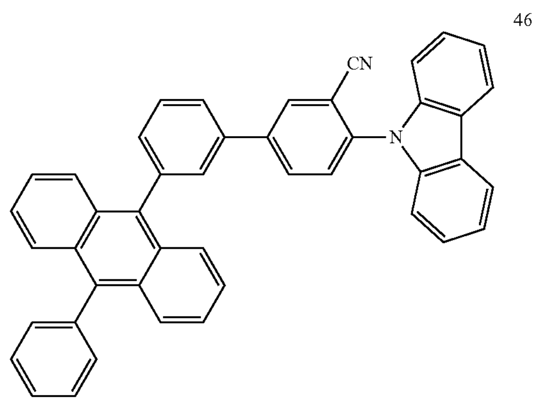
47
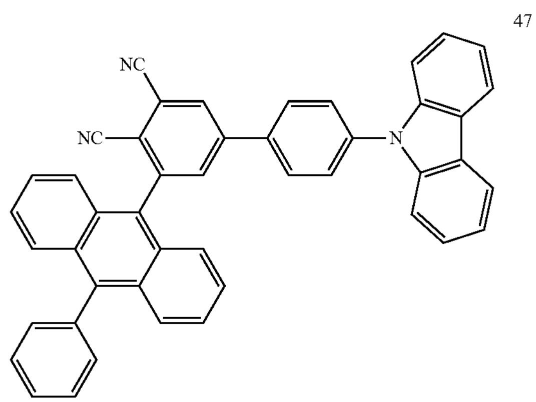
48
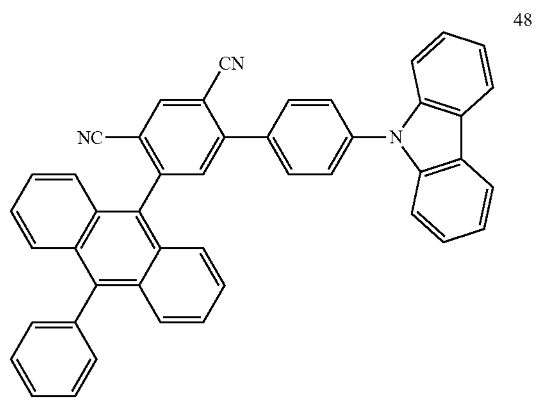
49
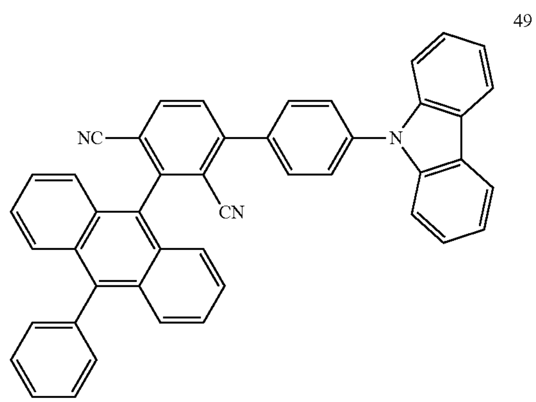

-continued
50
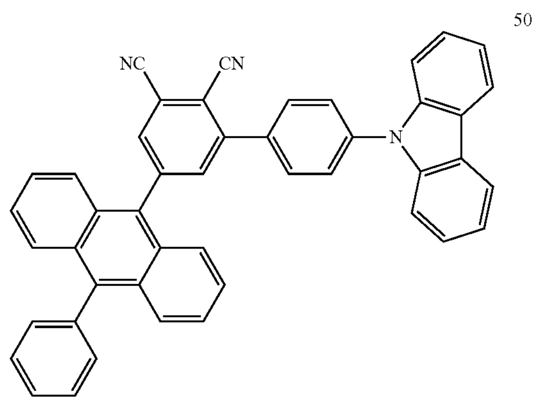
51
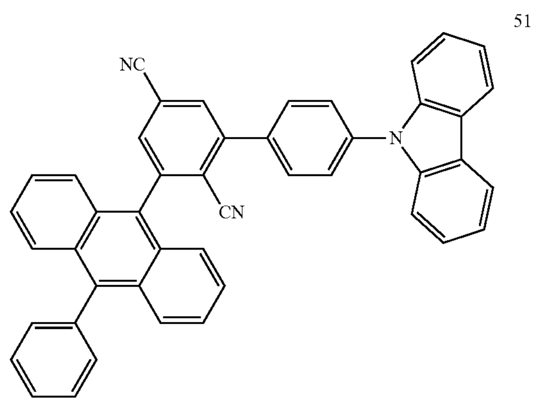
52
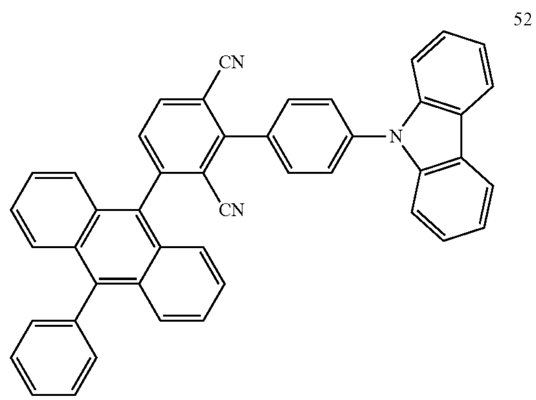
53
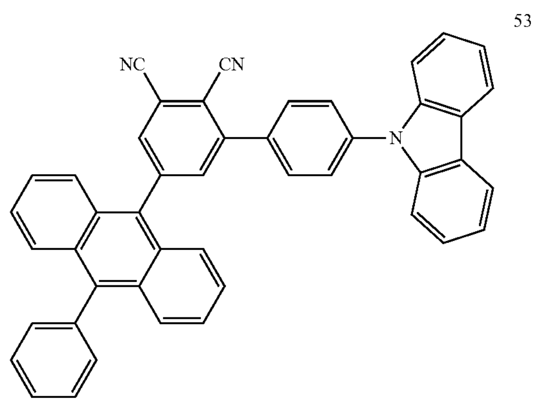

-continued
54
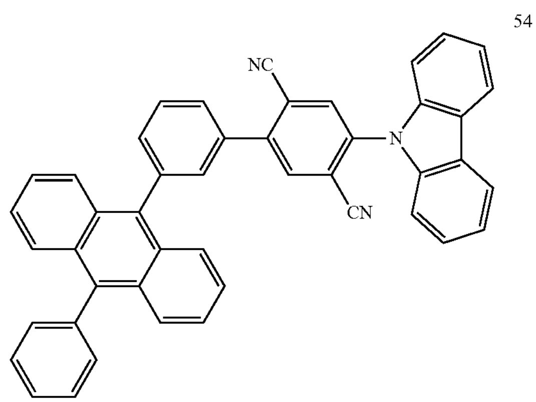
55
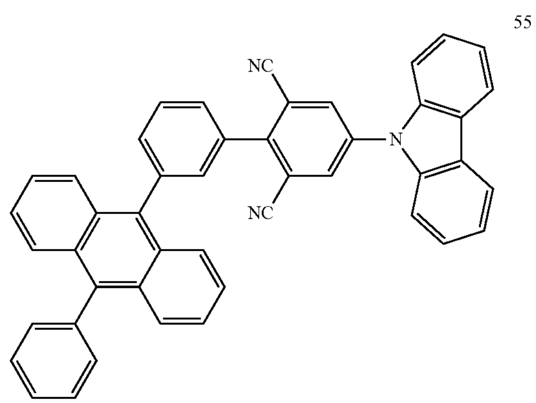
56
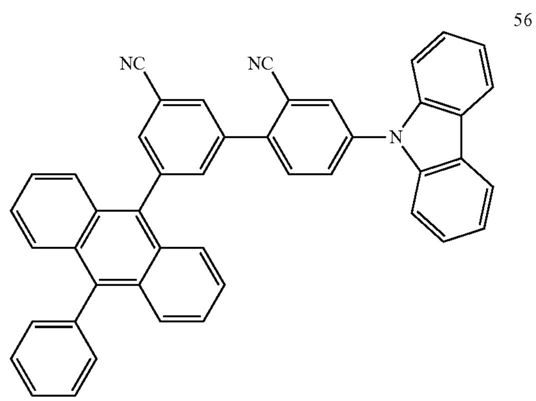
57
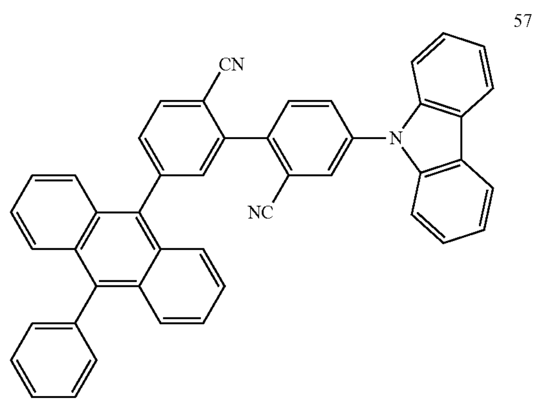

-continued
58
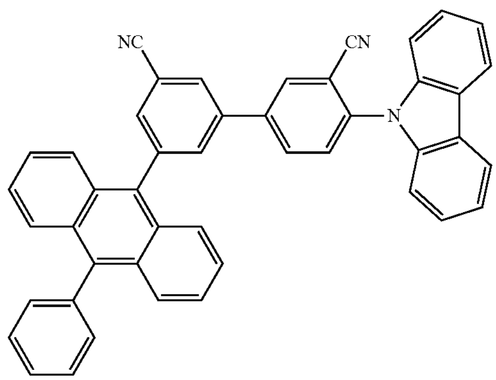
59
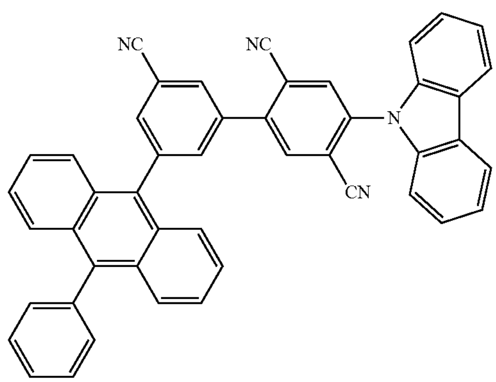
60
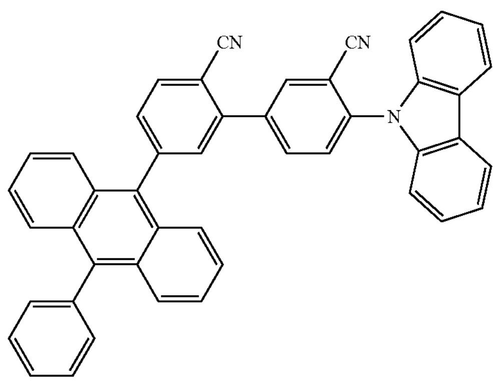
61
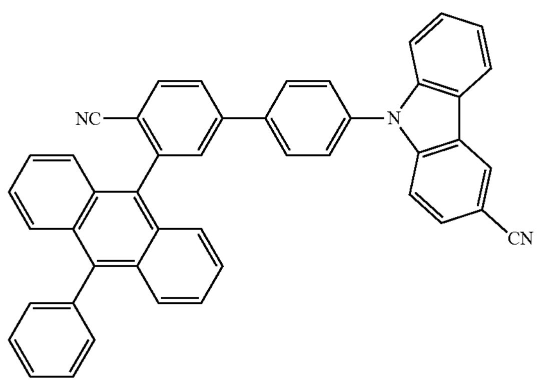

-continued
62
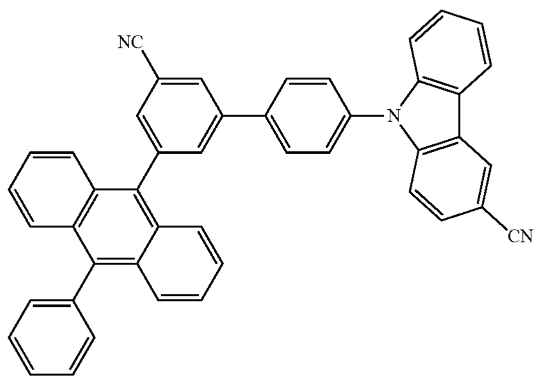
63
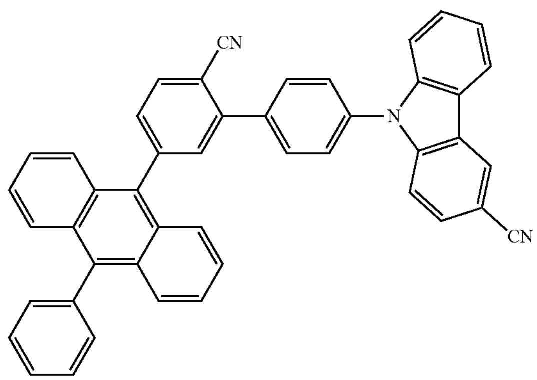
64
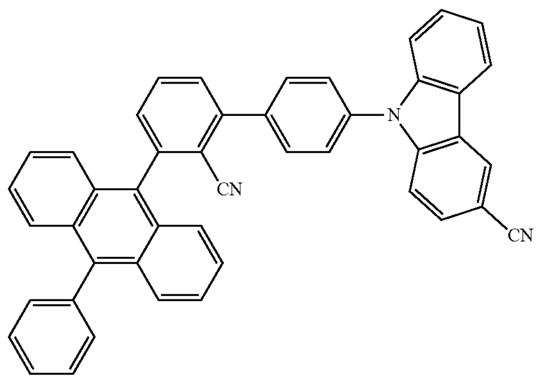
65
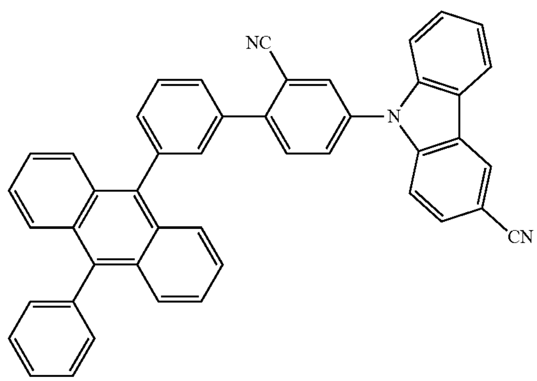

-continued
66
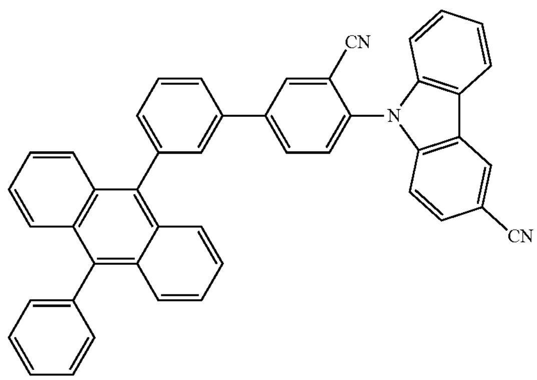
67
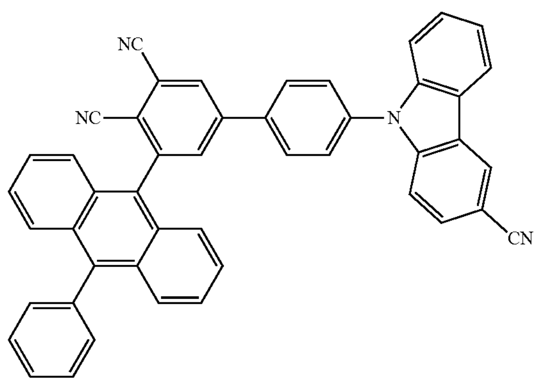
68
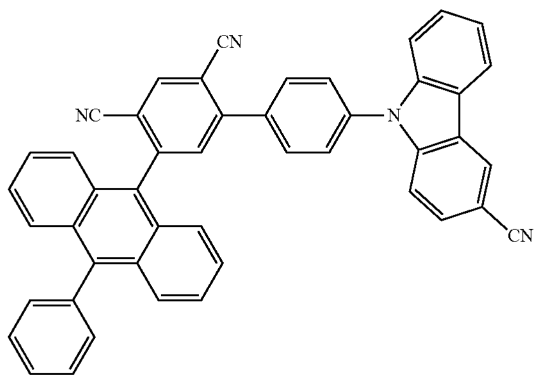
69
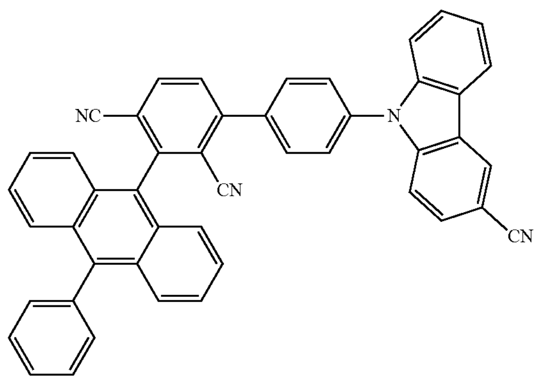

-continued
70
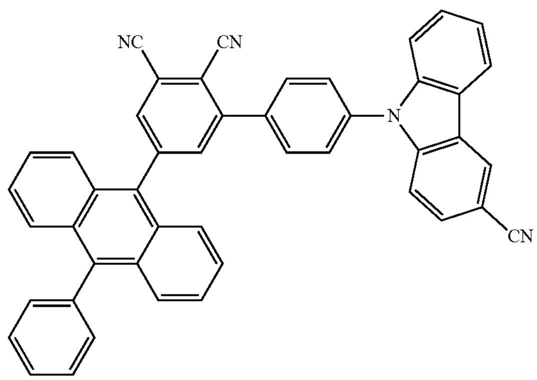
71
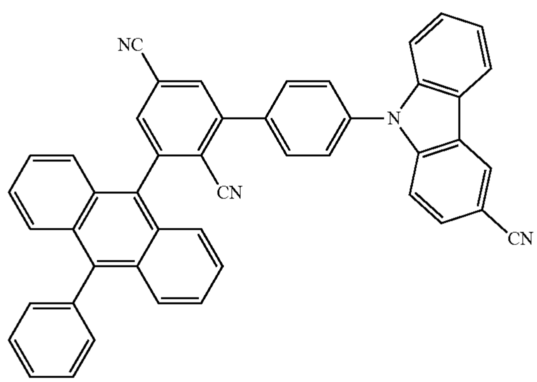
72
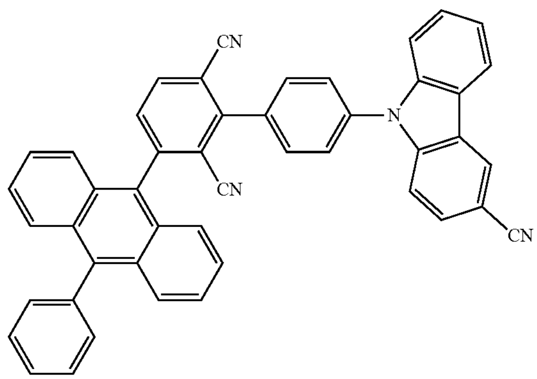
73
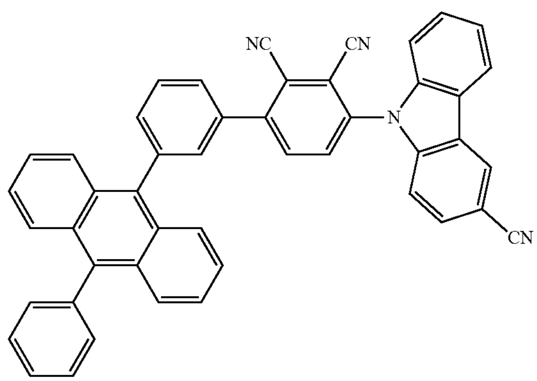

-continued
74
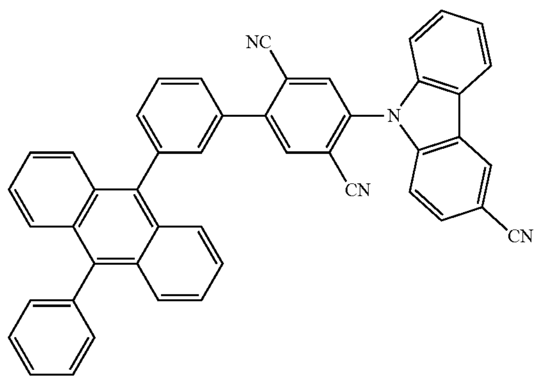
75
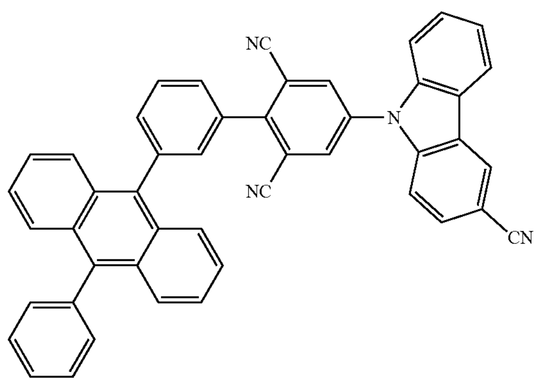
76
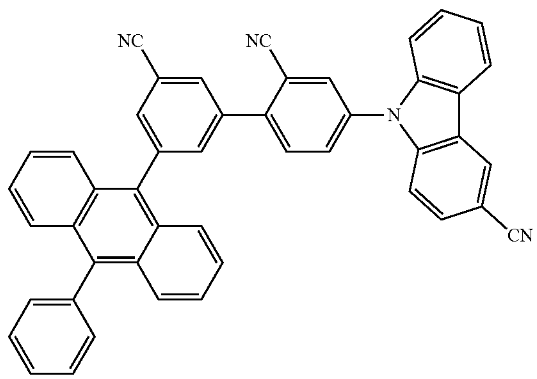
77
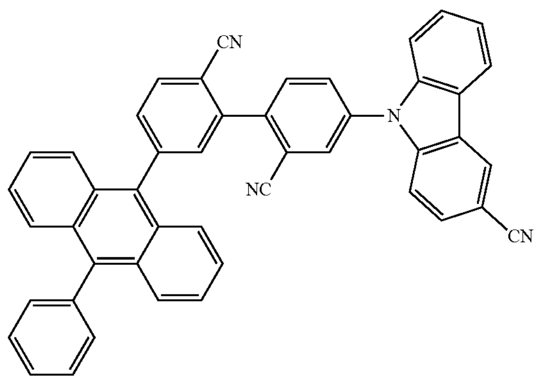

-continued
77
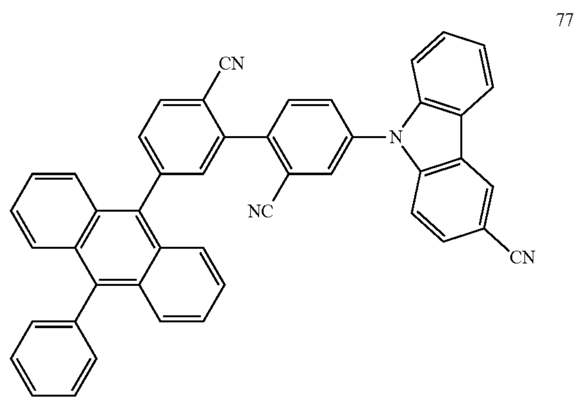
78
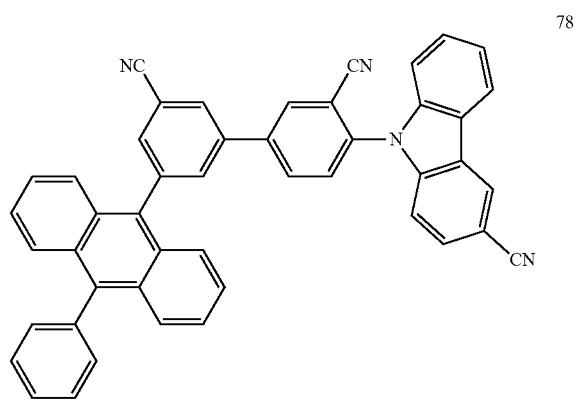
79
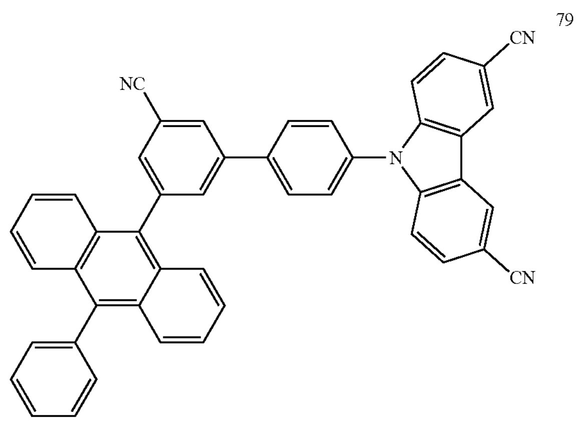
80
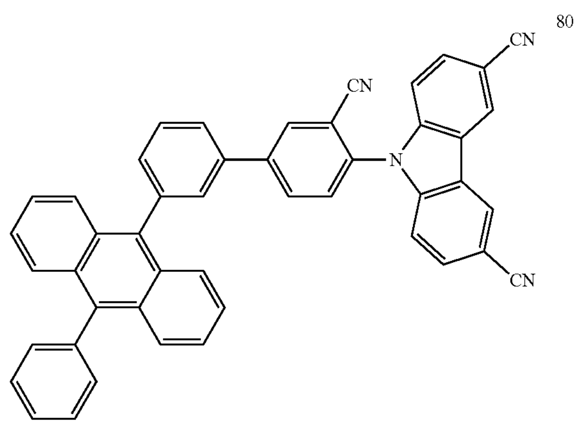

-continued
81
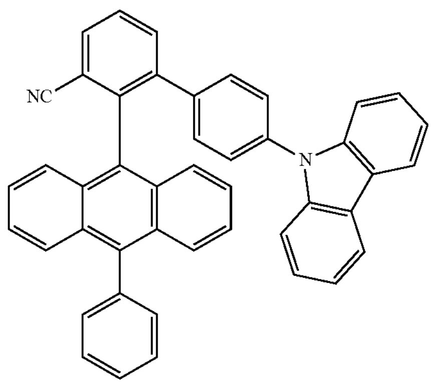
82
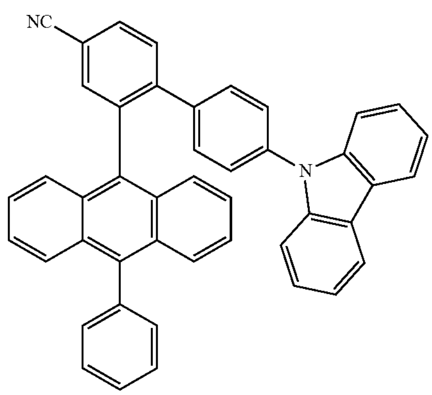
83
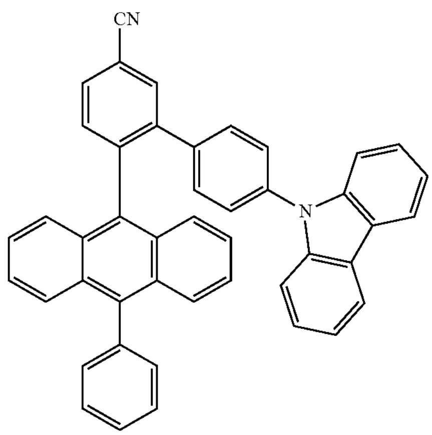
84
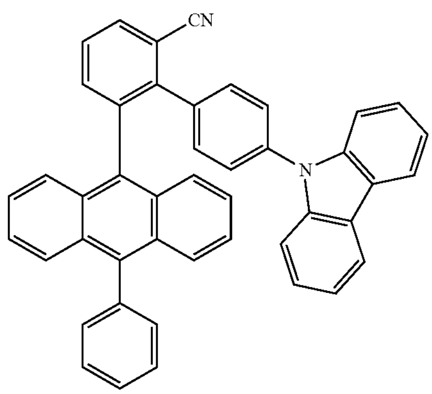

-continued
85
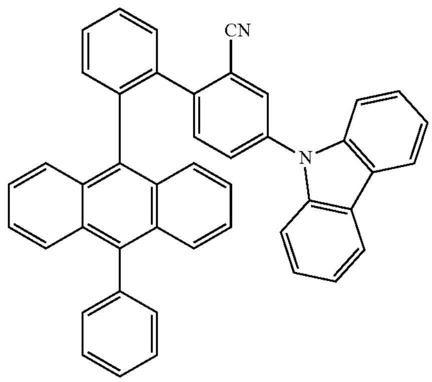
86
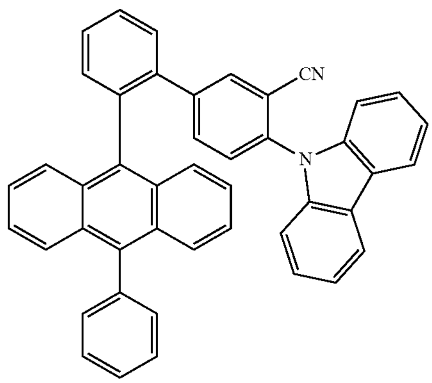
87
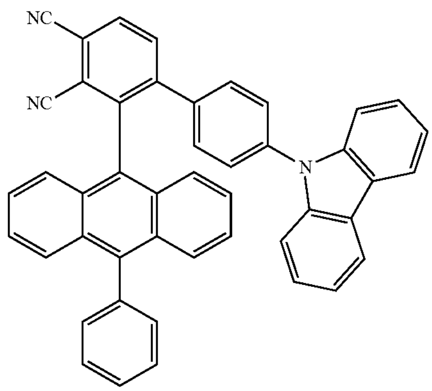
88
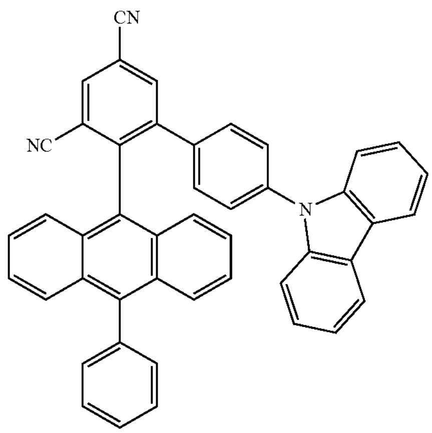

-continued
89
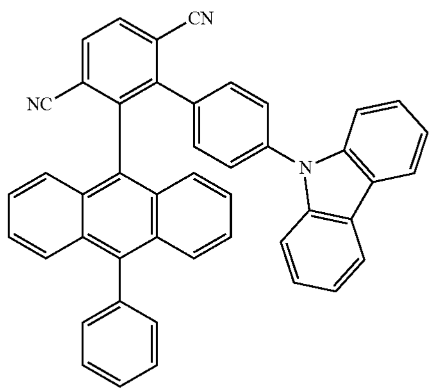
90
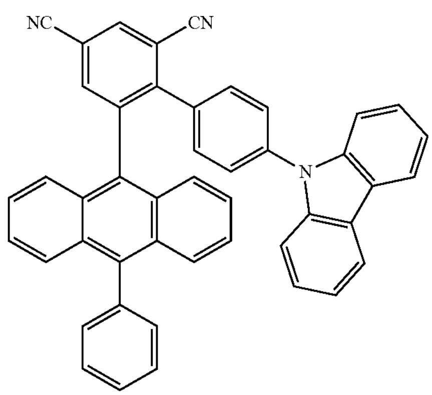
91
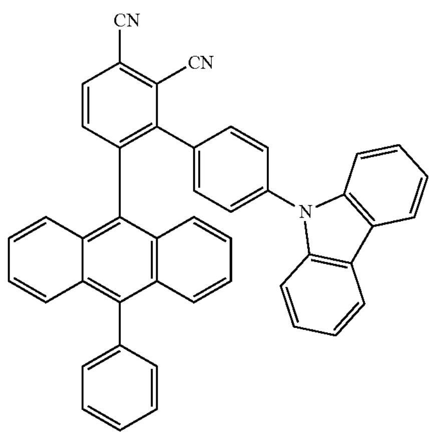
92
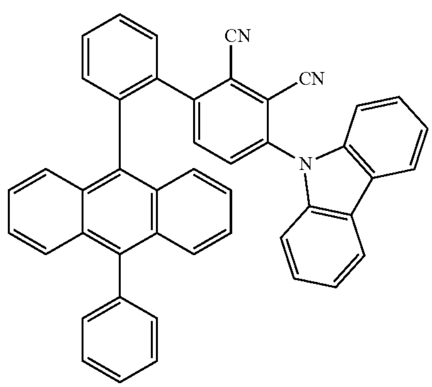

-continued
93
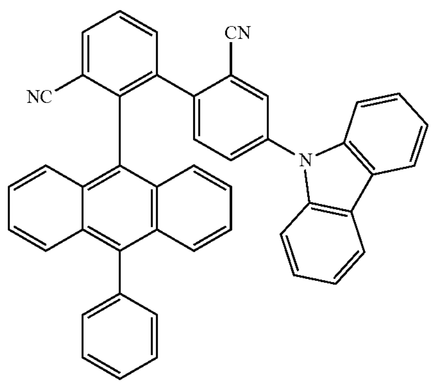
94
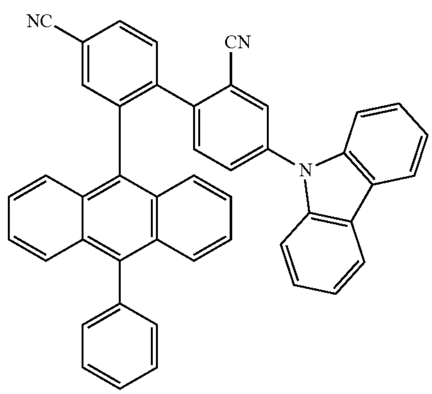
95
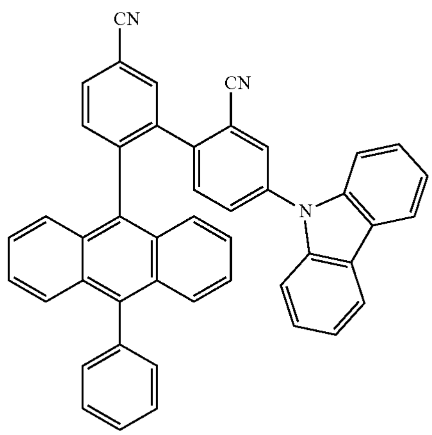
96
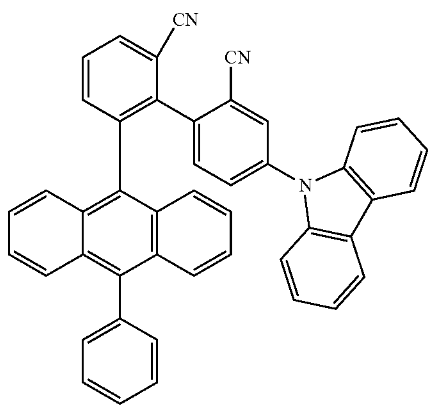

-continued
97
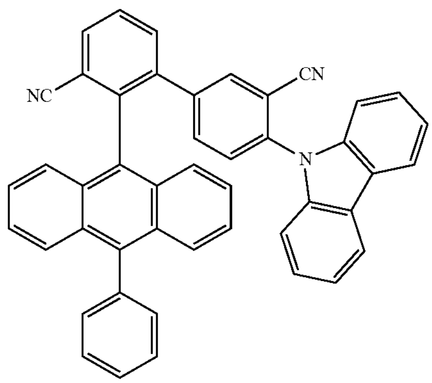
98
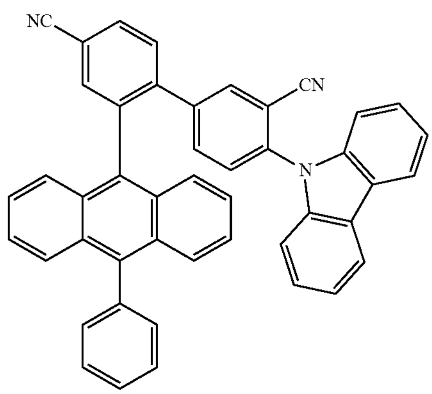
99
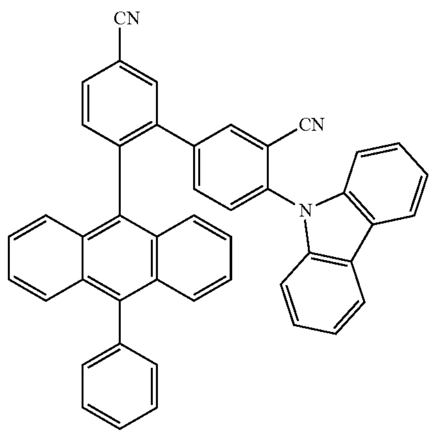
100
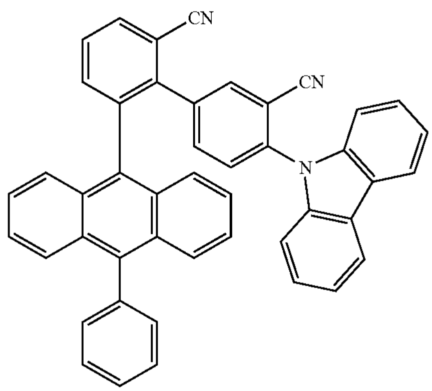

-continued
101
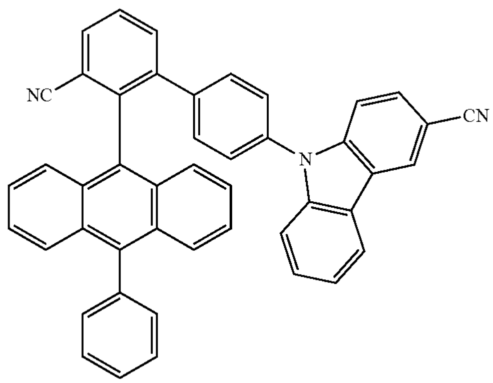
102
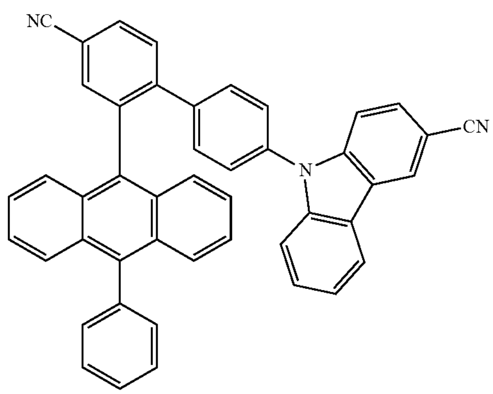
103
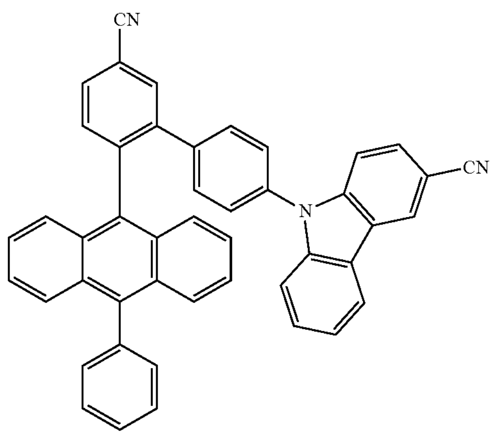
104
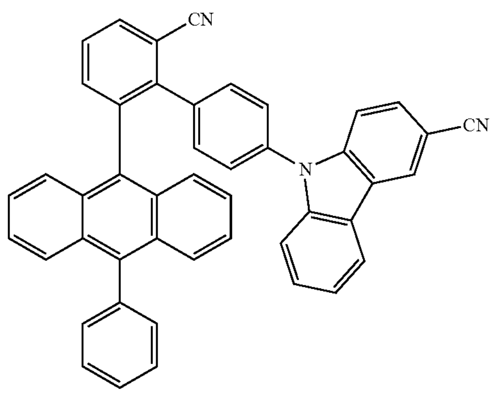

-continued
105
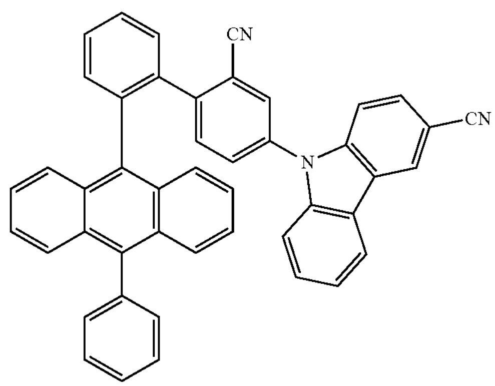
106
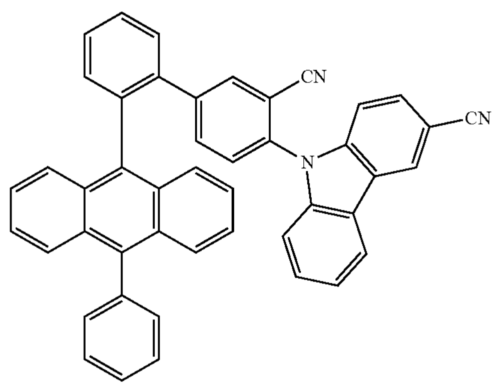
107
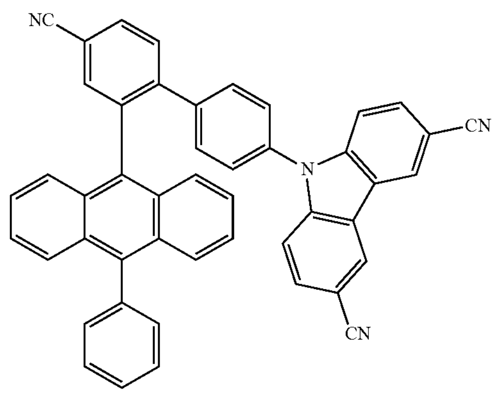
108
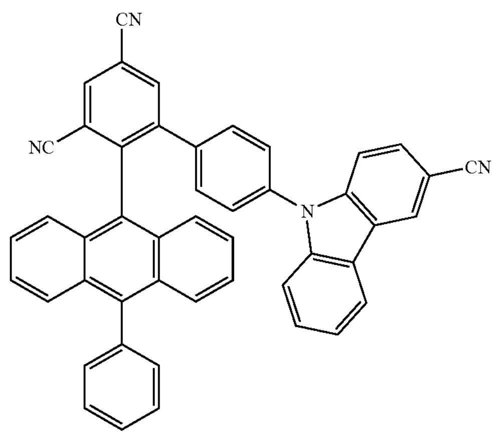

-continued
109
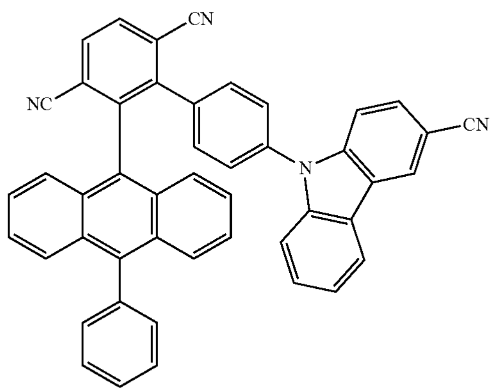
110
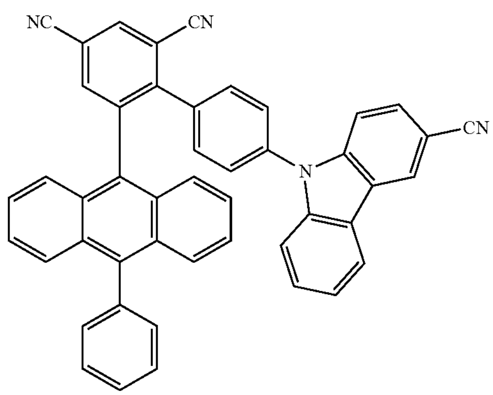
111
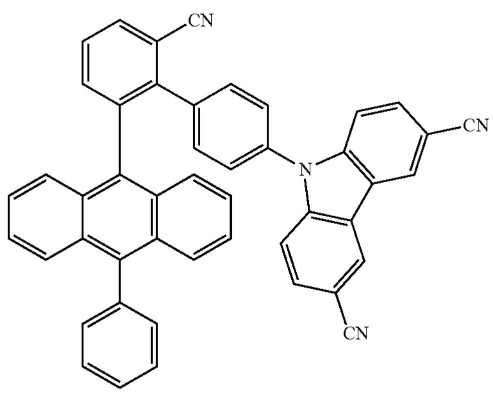
112
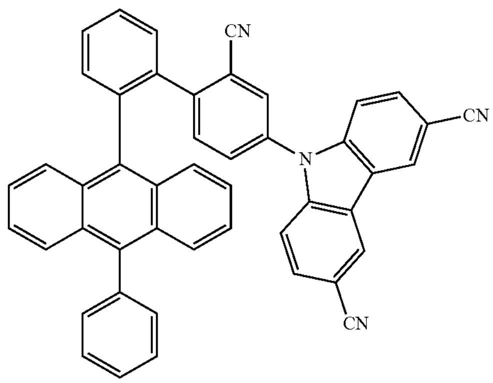

-continued
113
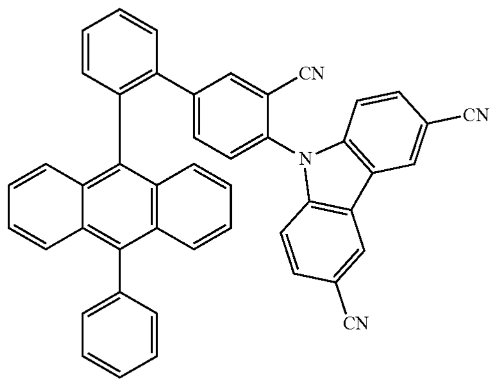
114
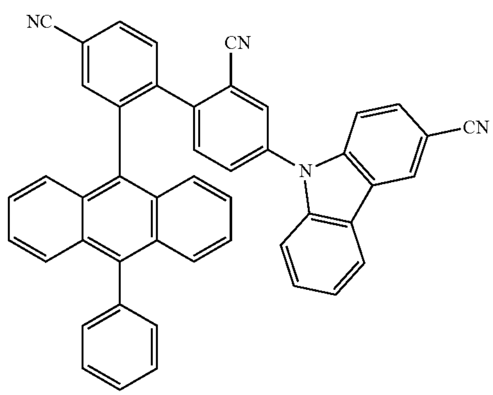
115
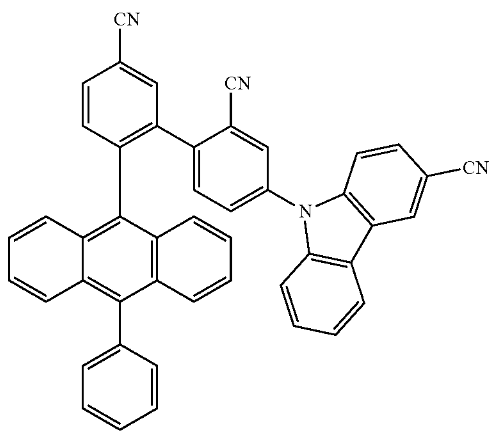
116
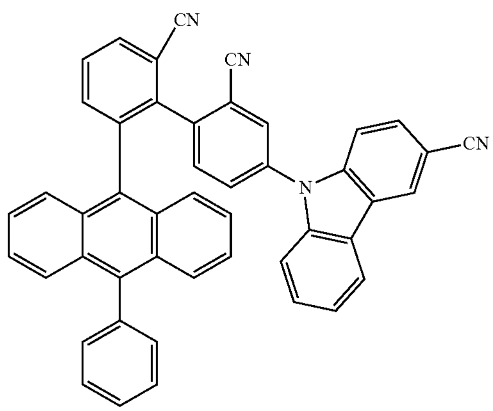

-continued
117
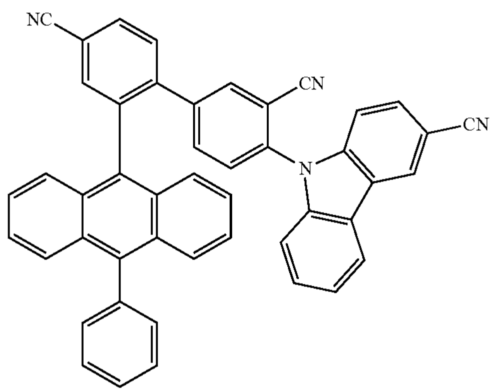
118
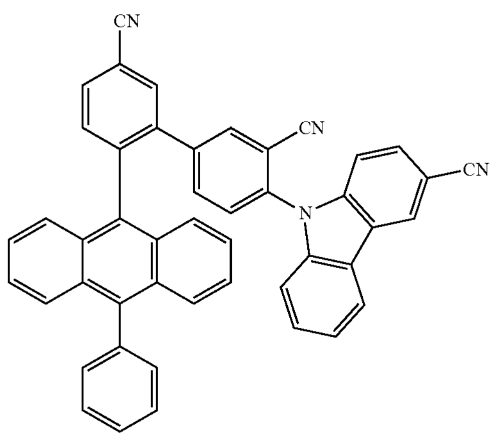
119
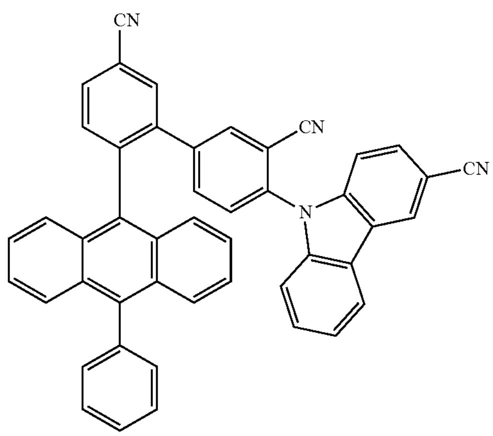
120
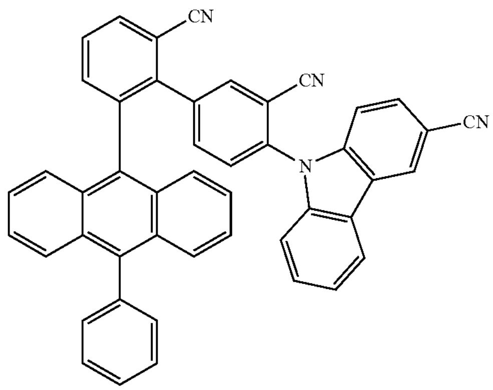

-continued
121
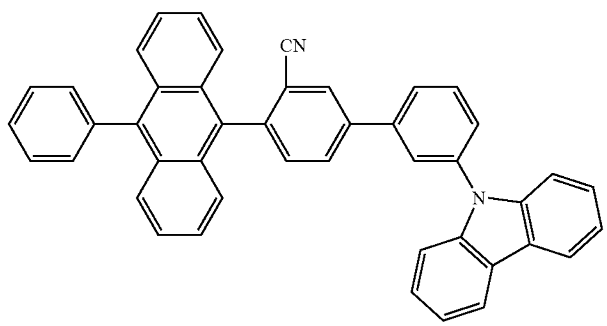
122
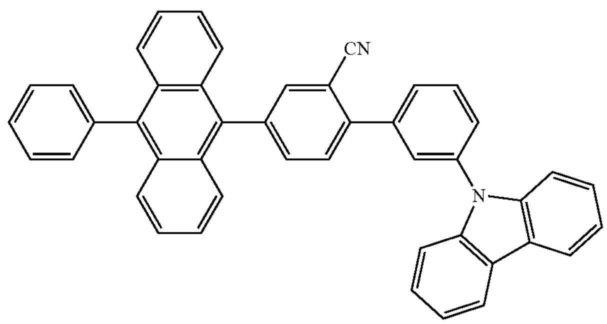
123
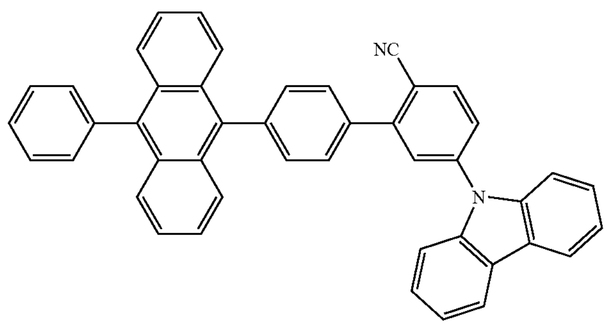
124
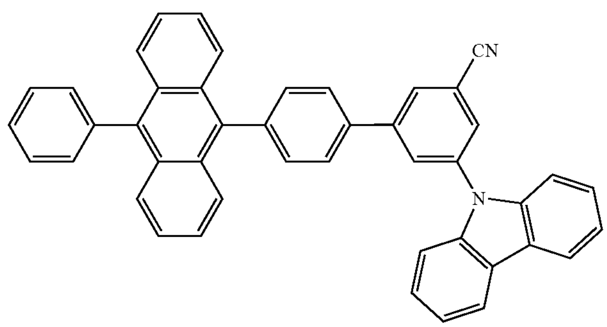
125
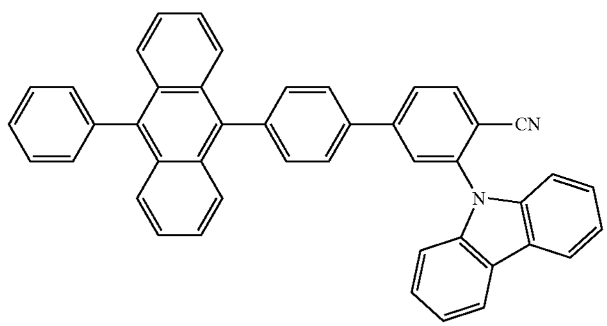

-continued
126
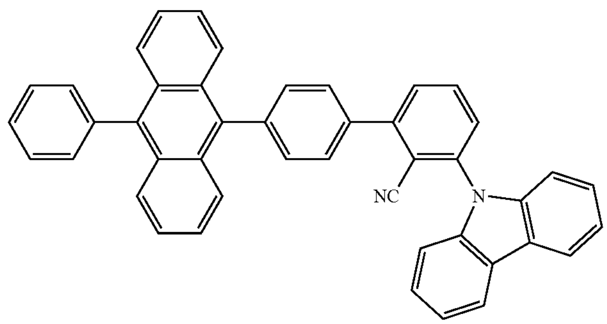
127
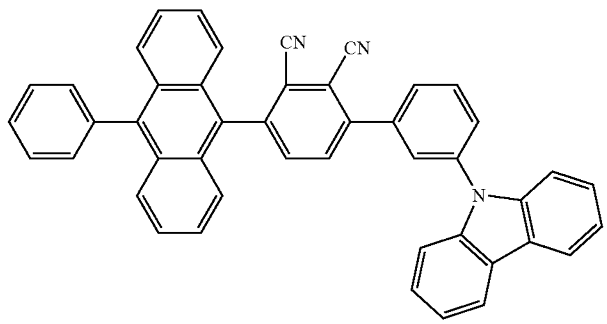
128
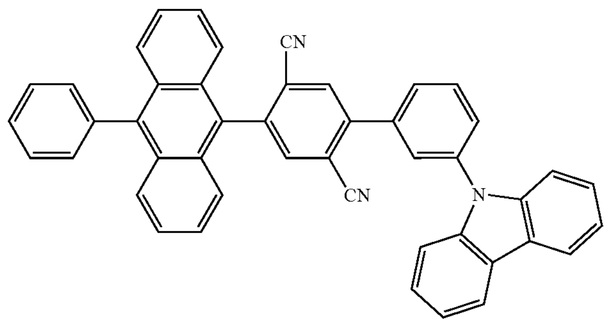
129
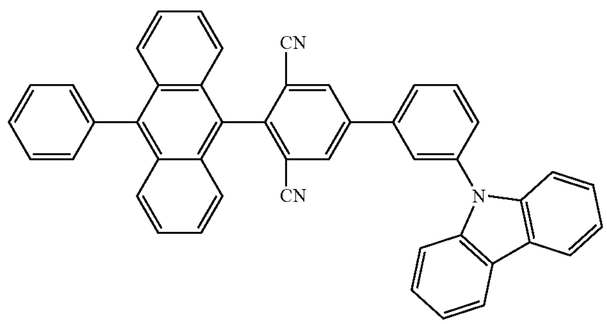
130
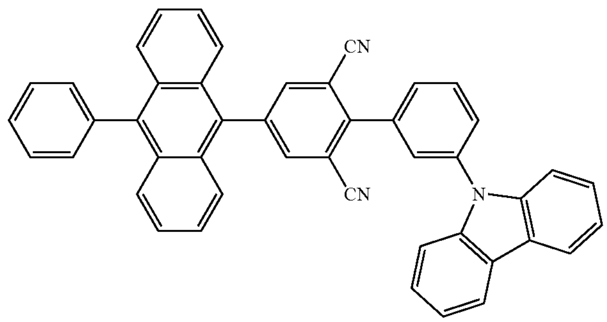

-continued
131
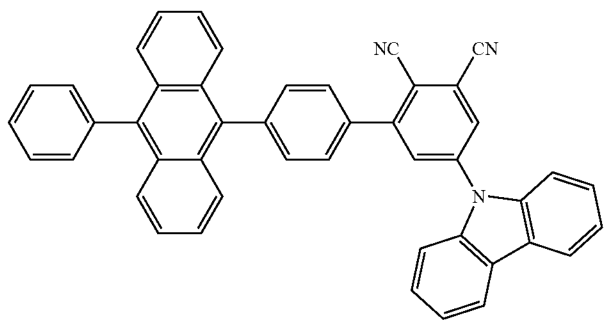
132
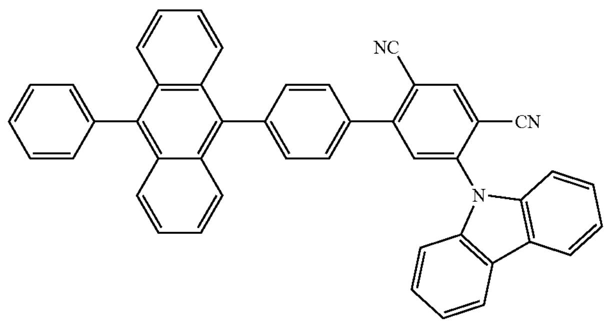
133
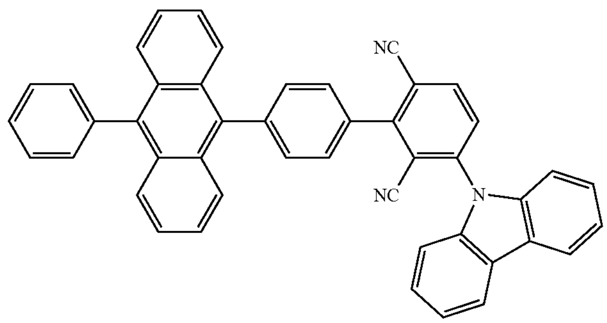
134
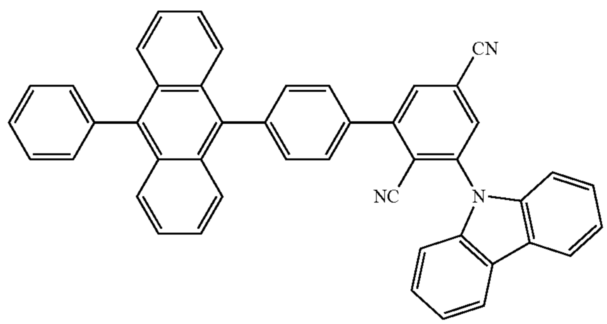
135
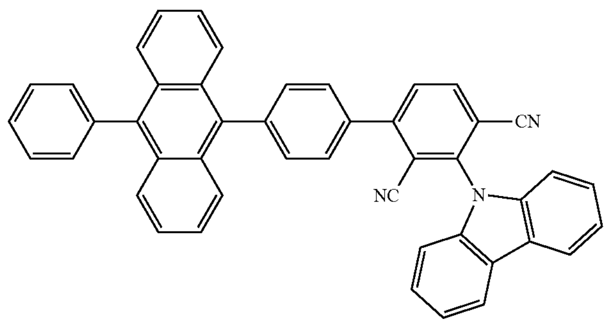

-continued
136
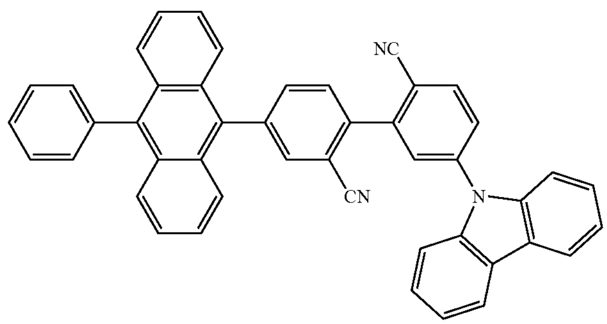
137
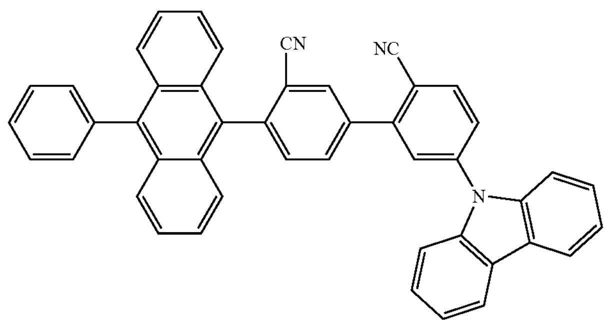
138
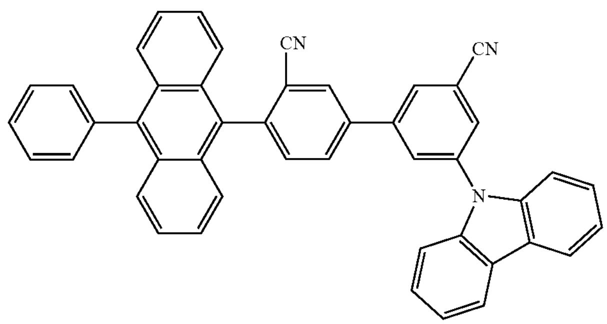
139
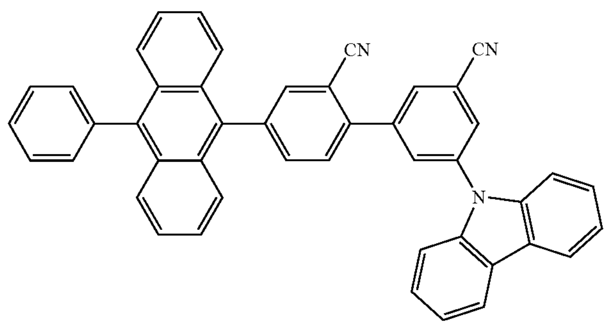
140
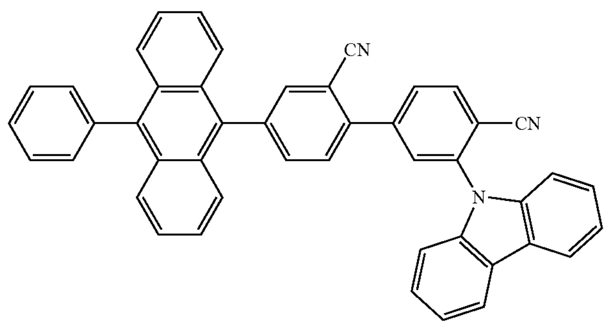

-continued
141
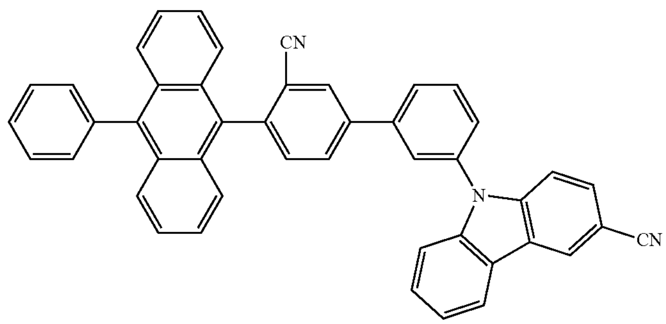
142
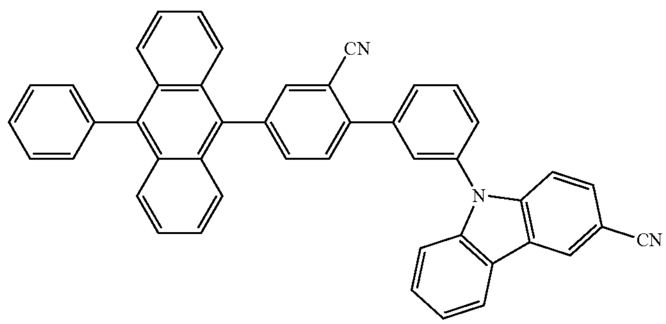
143
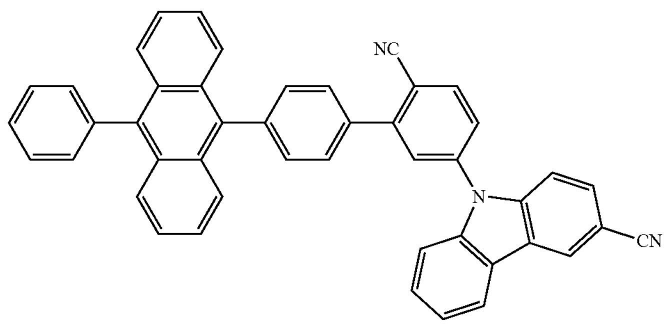
144
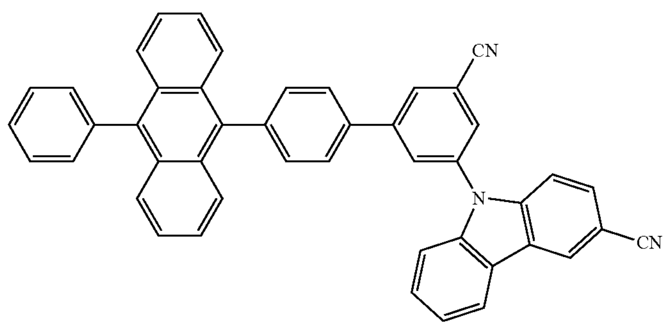
145
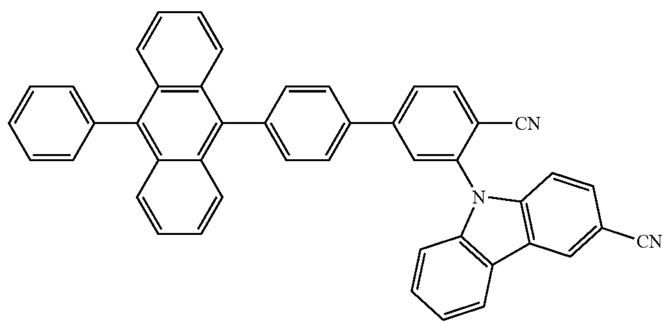

-continued
146
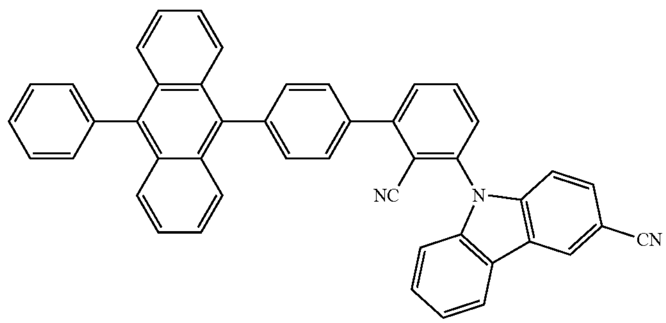
147
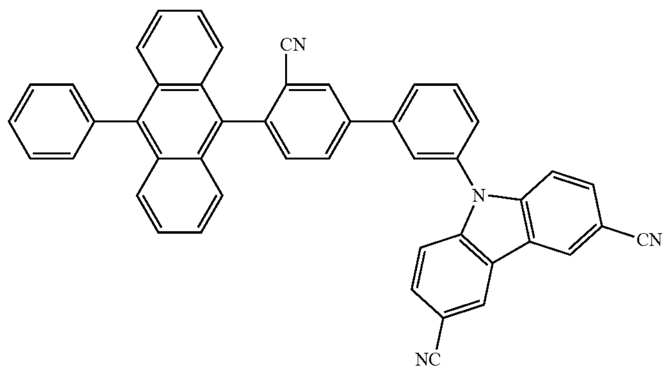
148
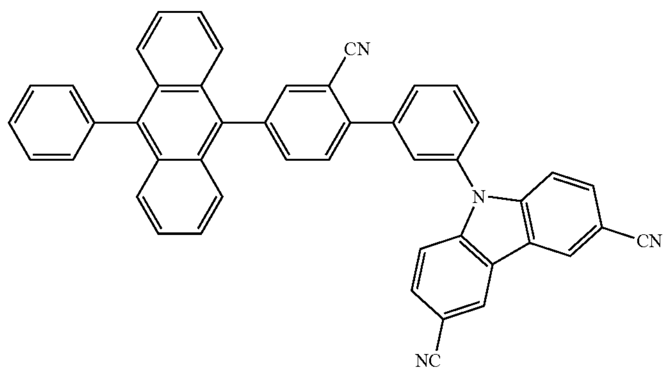
149
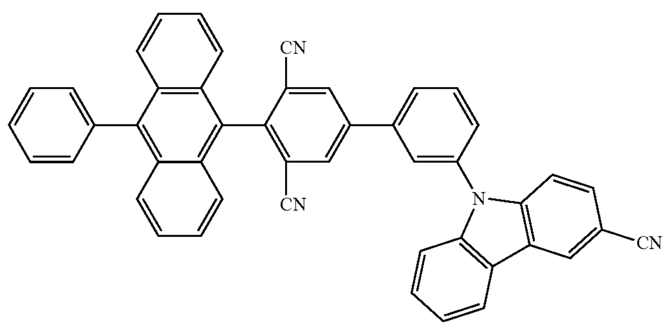

-continued
150
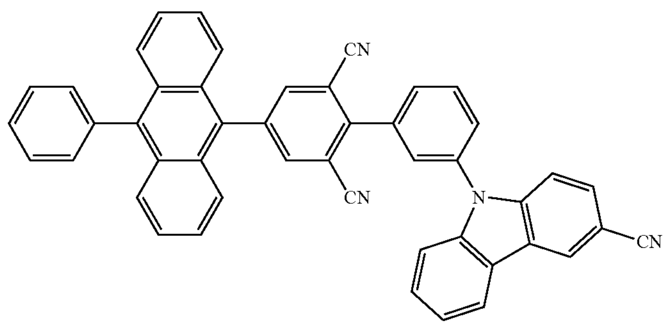
151
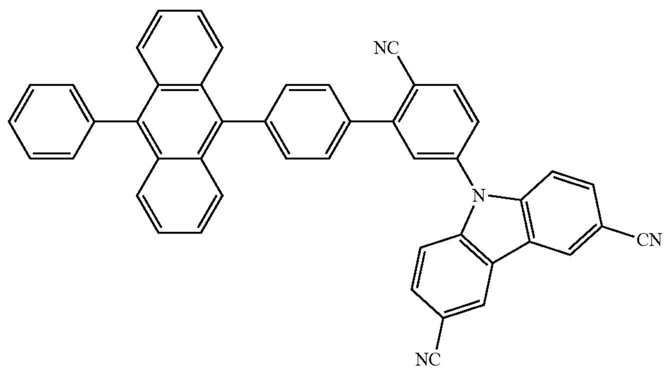
152
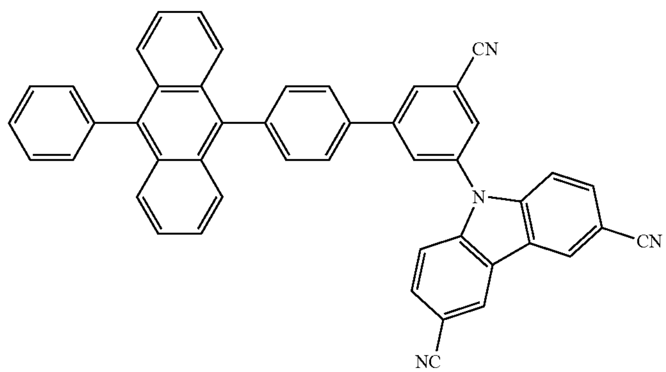
153
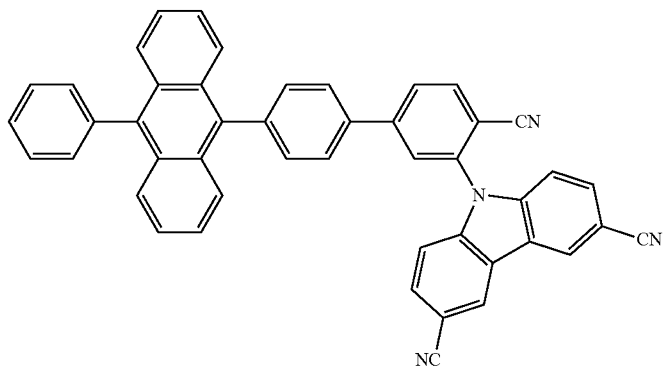

-continued
154
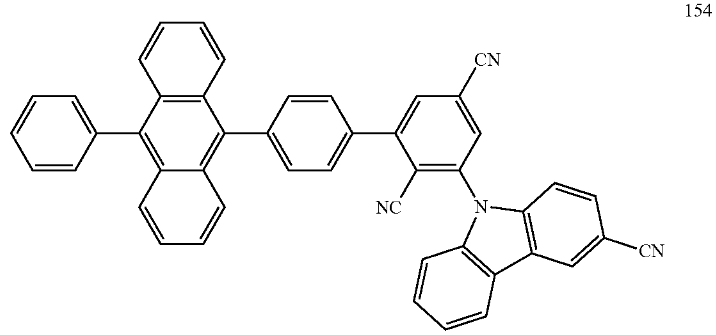
155
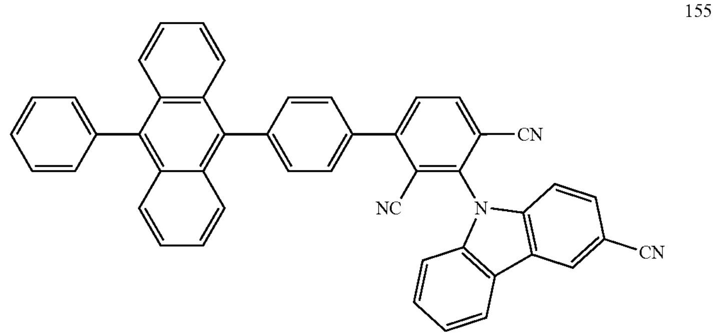
156
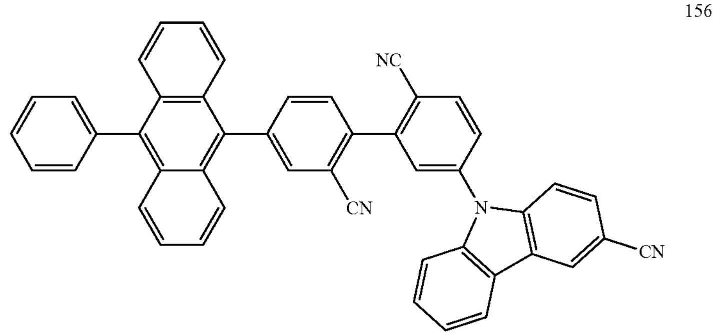
157
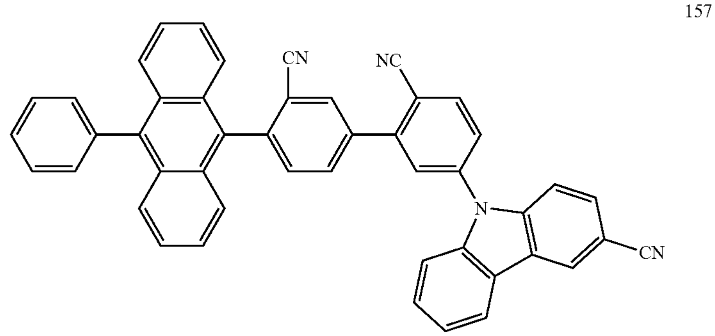
158
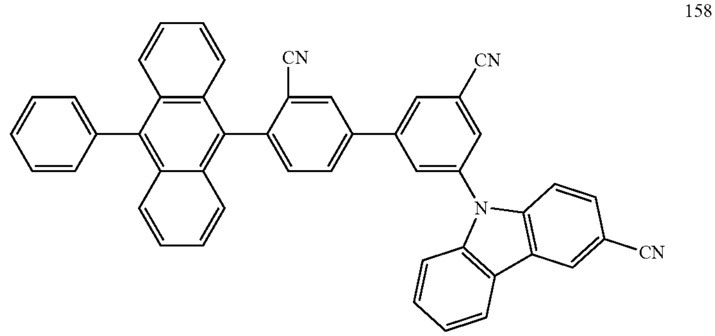

-continued
159
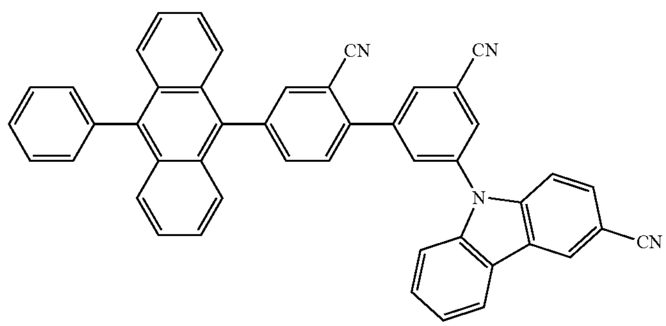
160
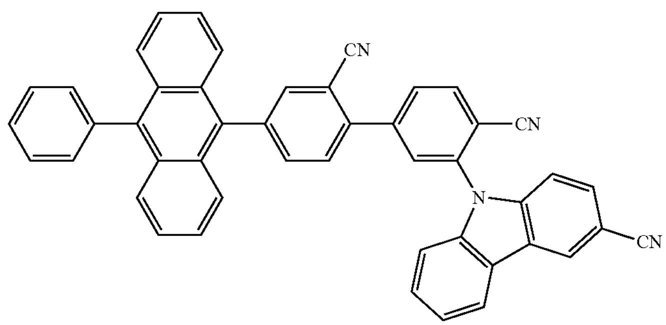
161
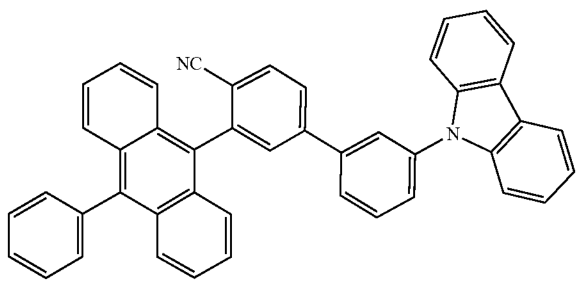
162
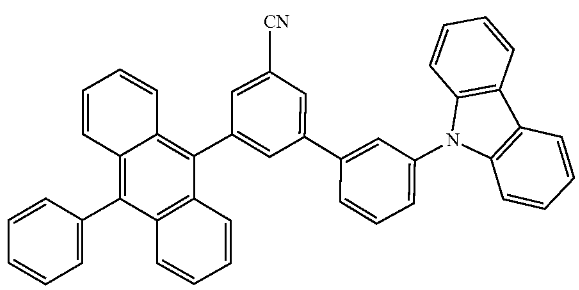
163
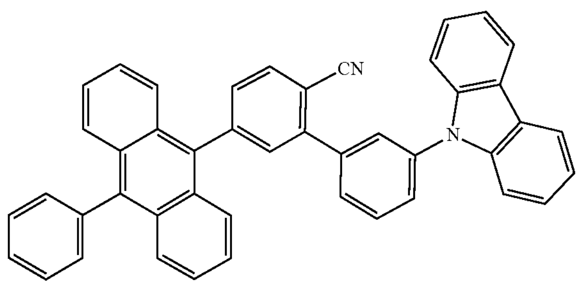

-continued
164
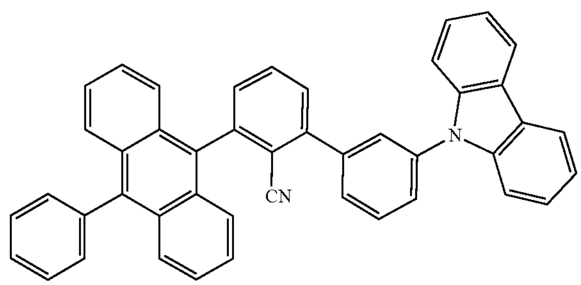
165
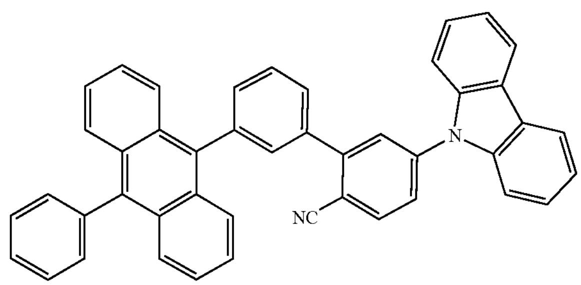
166
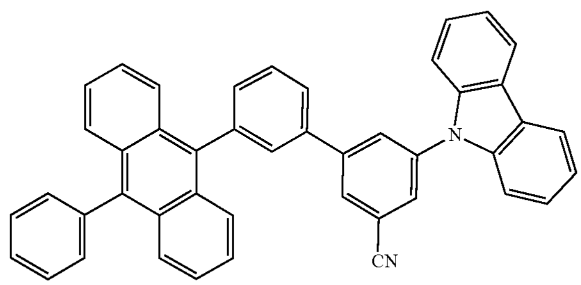
167
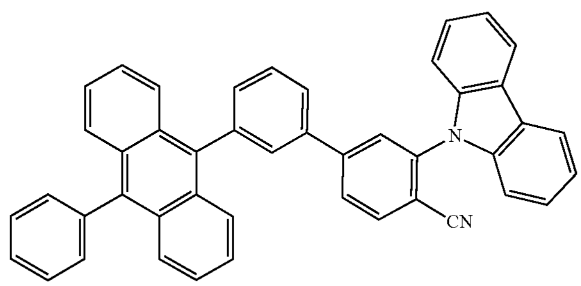
168
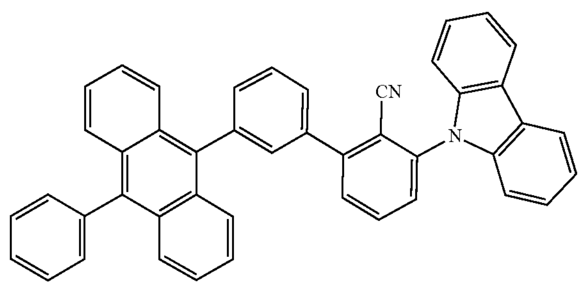

-continued
169
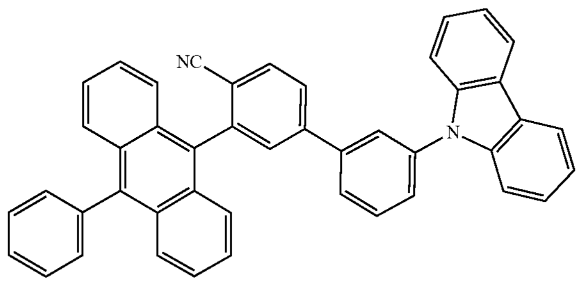
170
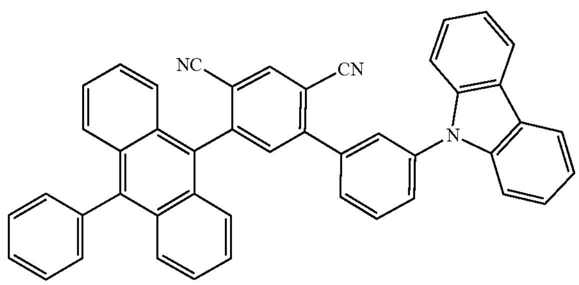
171
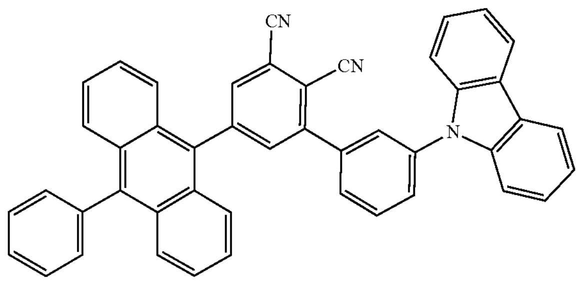
172
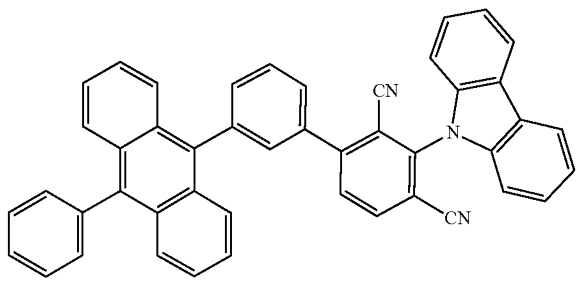
173
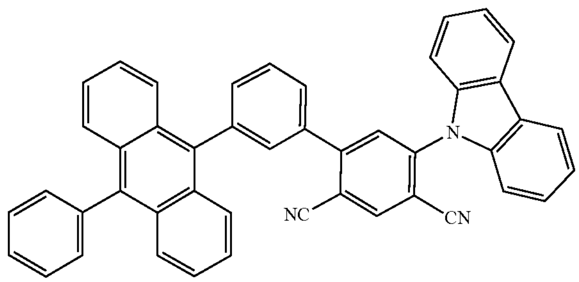

-continued
174
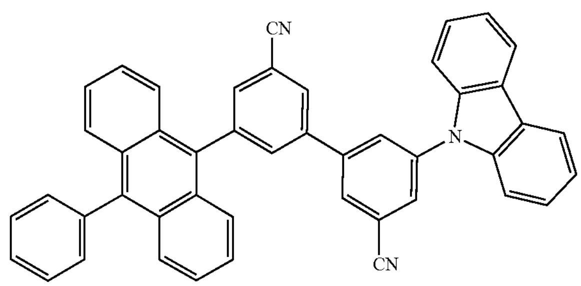
175
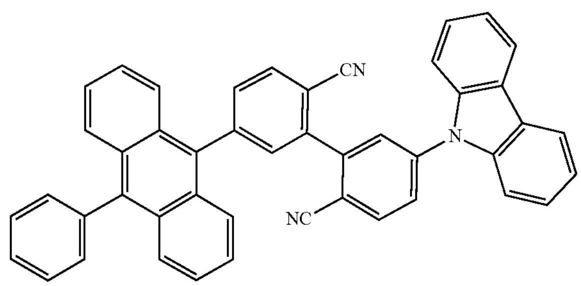
176
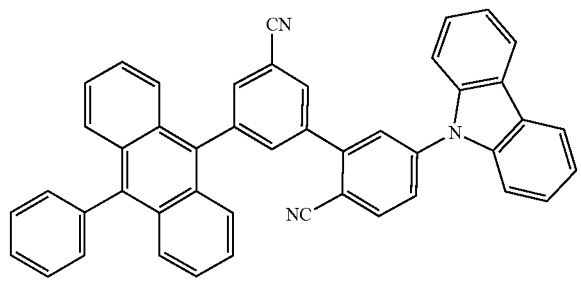
177
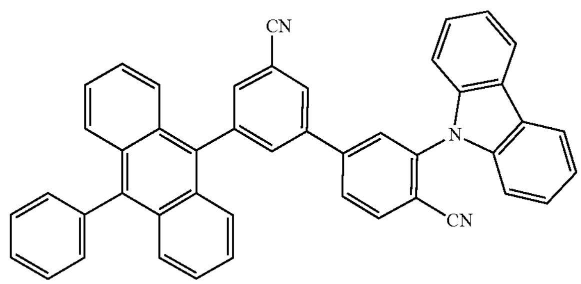
178
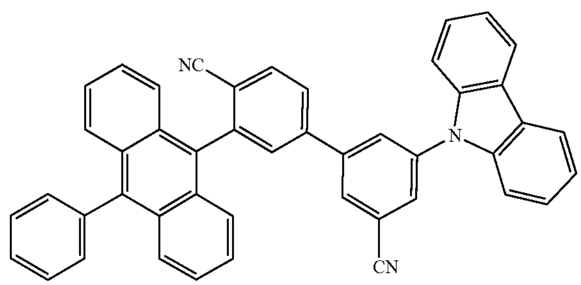

-continued
179
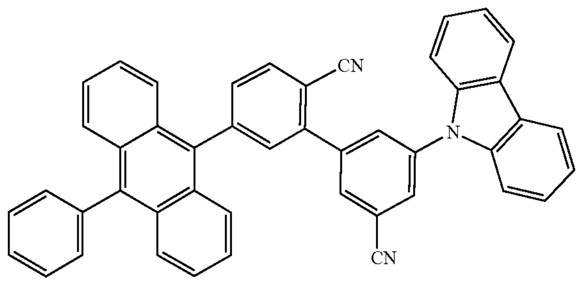
180
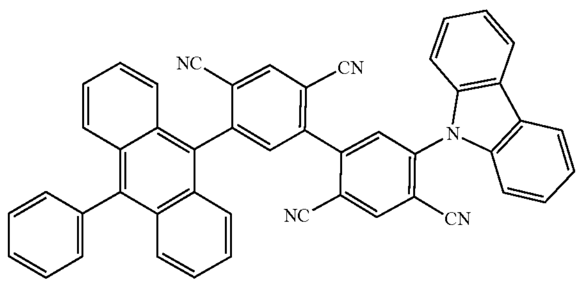
181
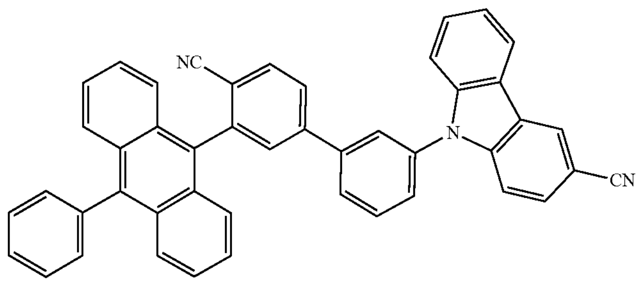
182
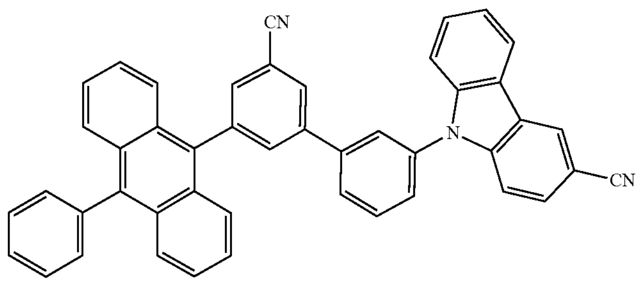
183
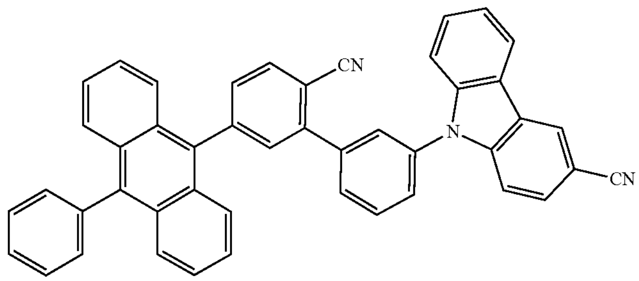

-continued
184
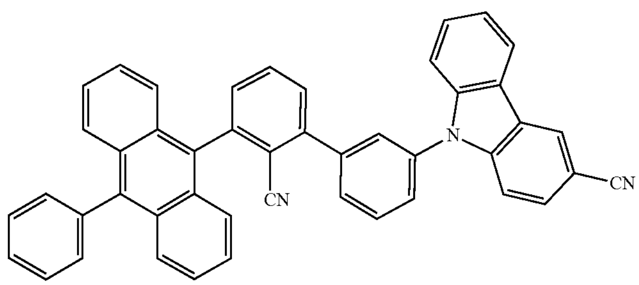
185
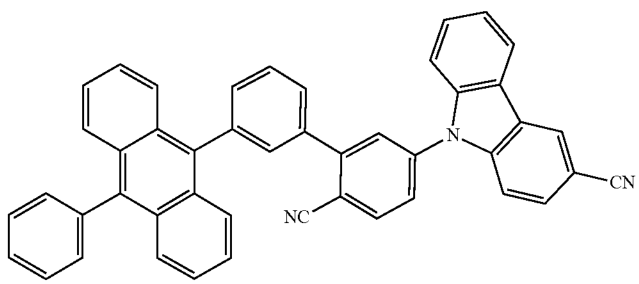
186
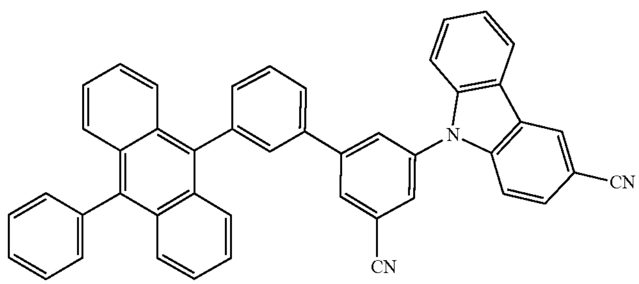
187
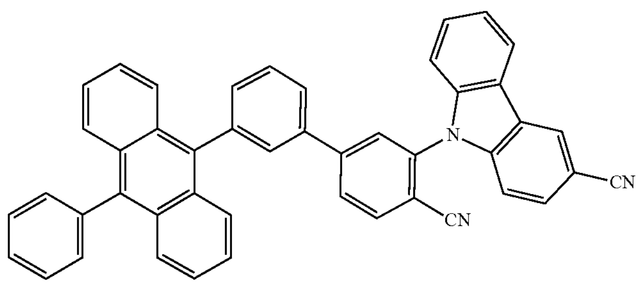
188
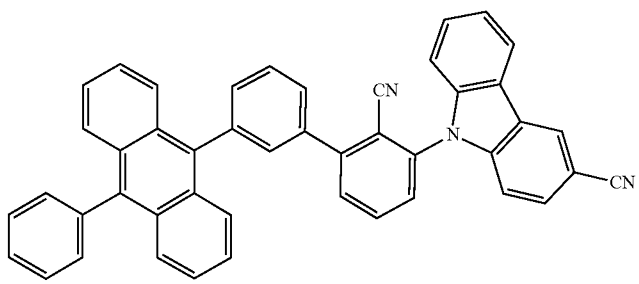

-continued
189
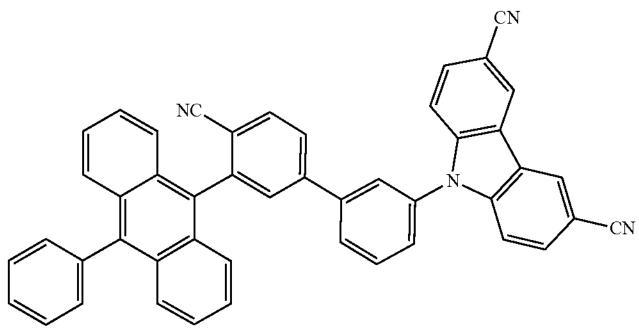
190
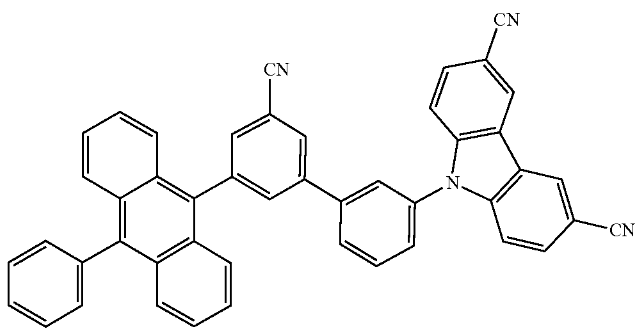
191
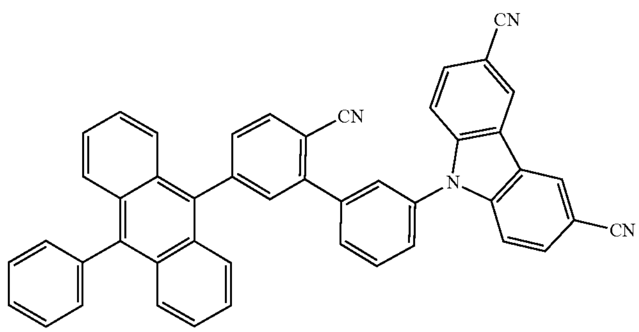
192
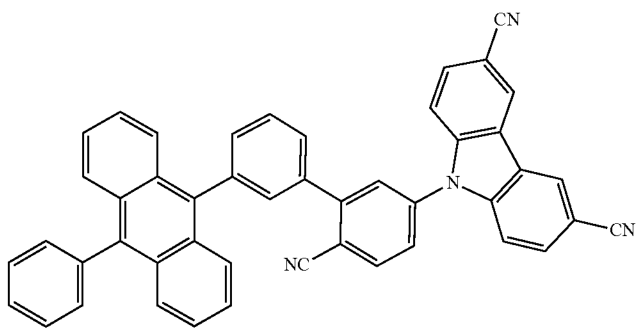
193
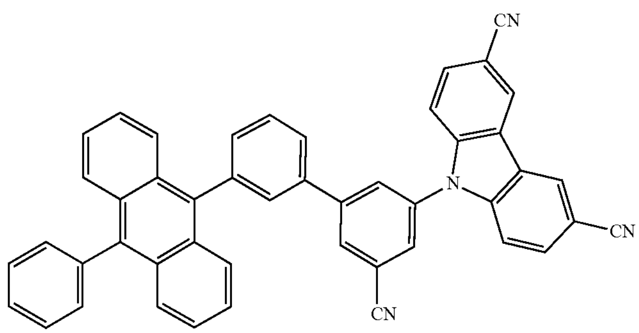

-continued
194
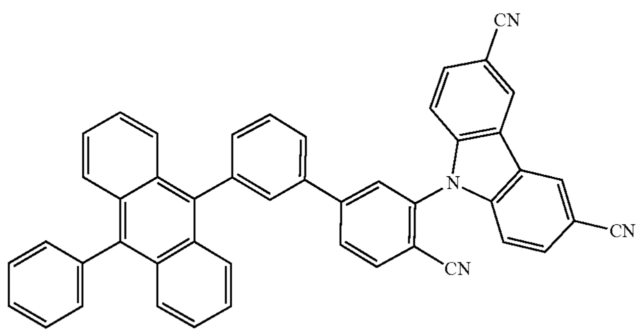
195
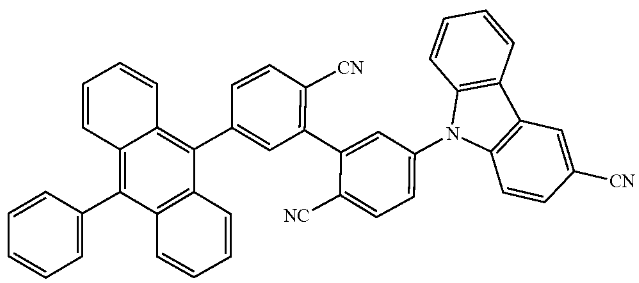
196
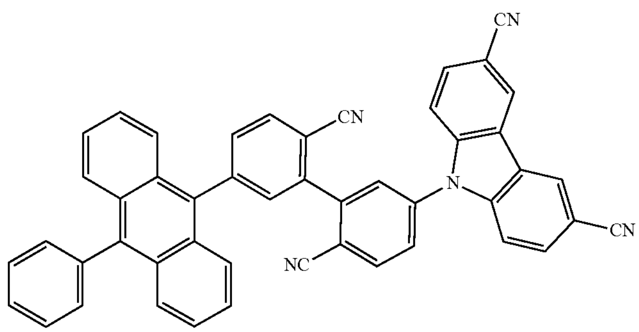
197
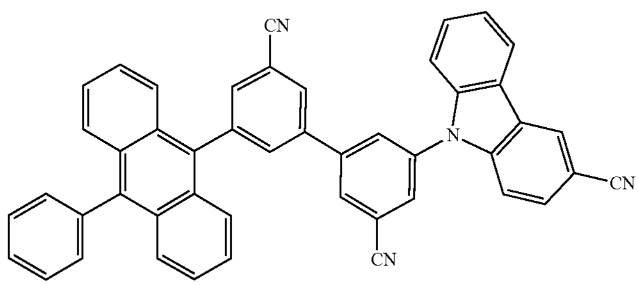
198
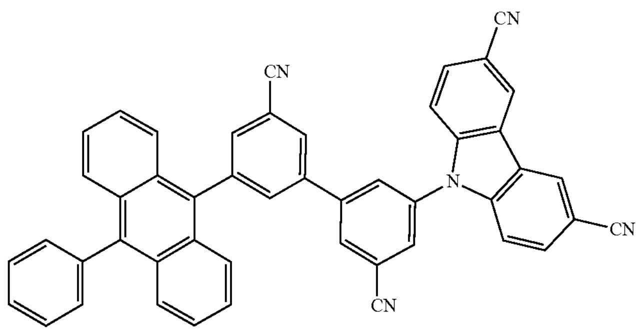

-continued
199
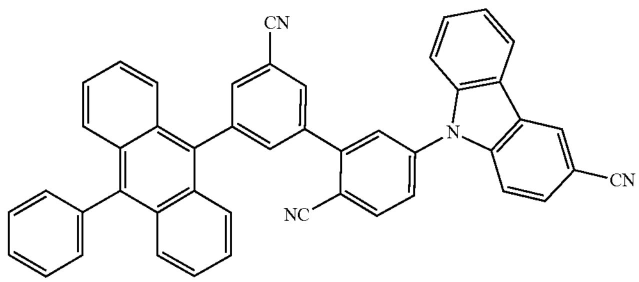
200
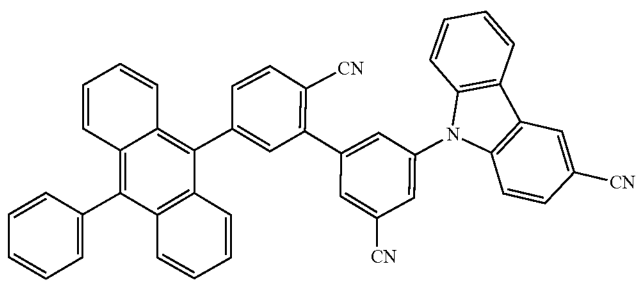
201
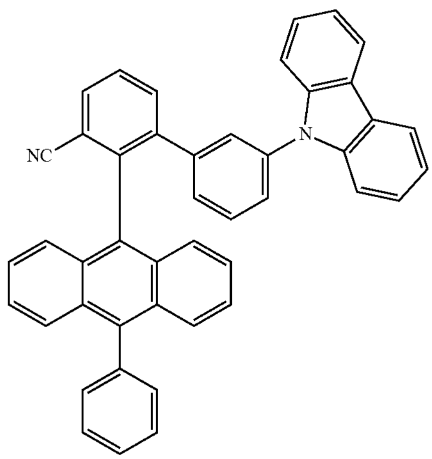
202
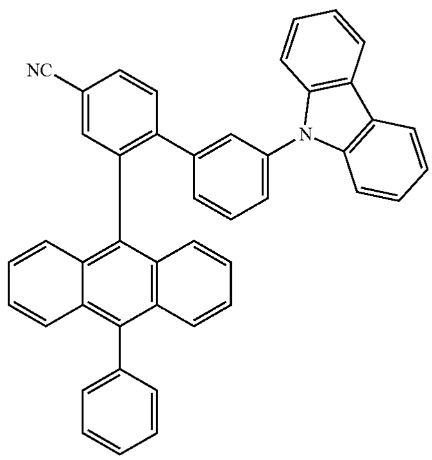

-continued
203
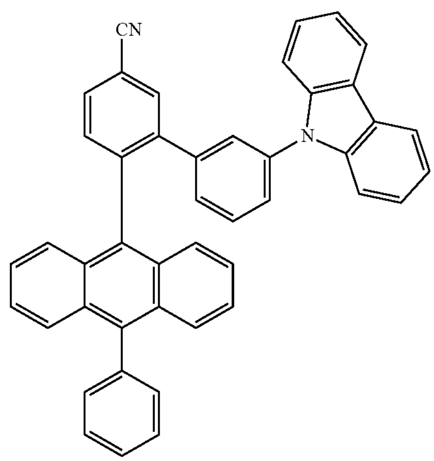
204
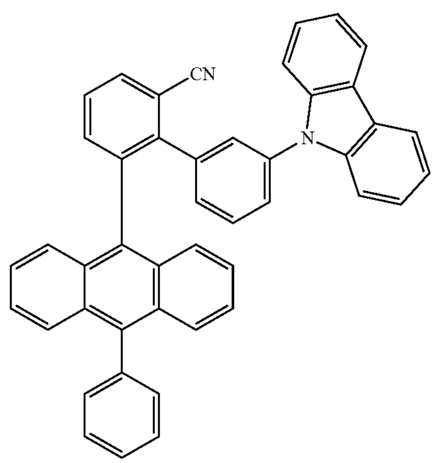
205
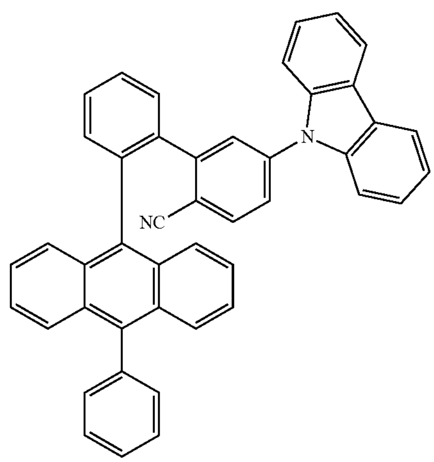

-continued
206
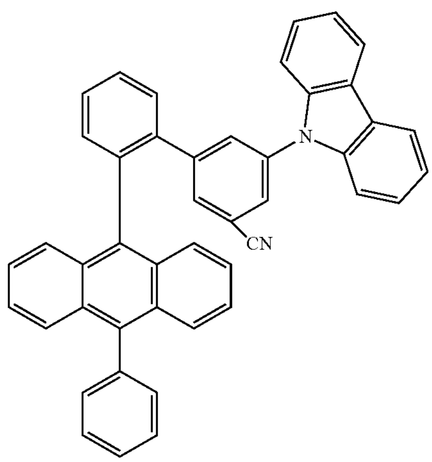
207
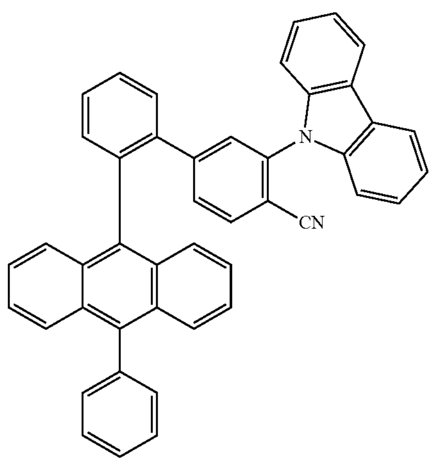
208
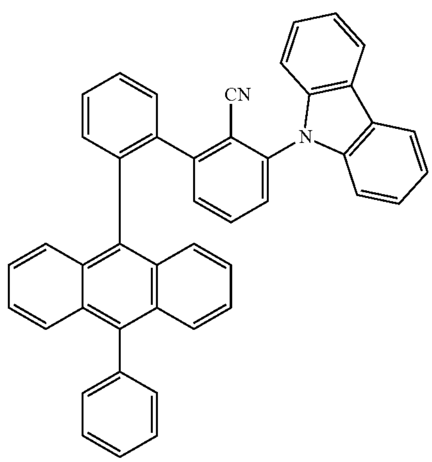

-continued
209
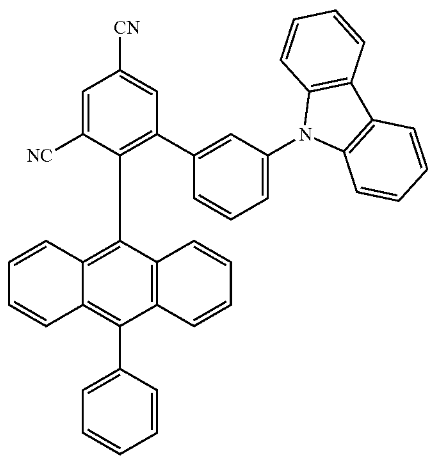
210
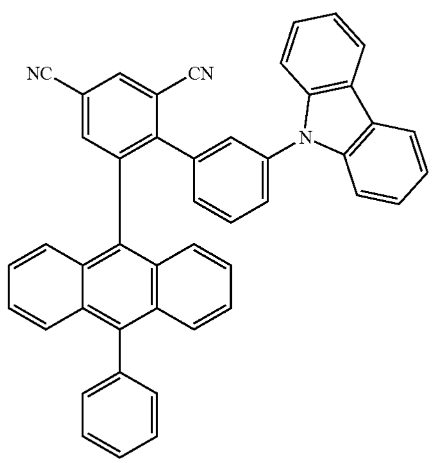
211
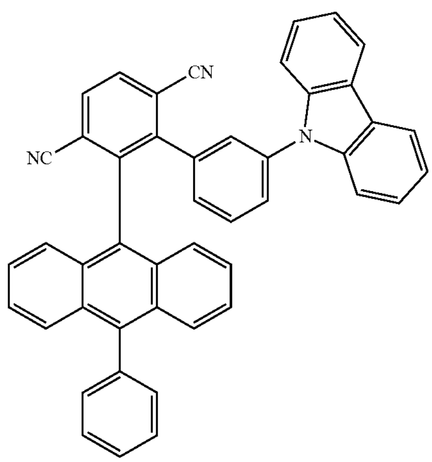

-continued
212
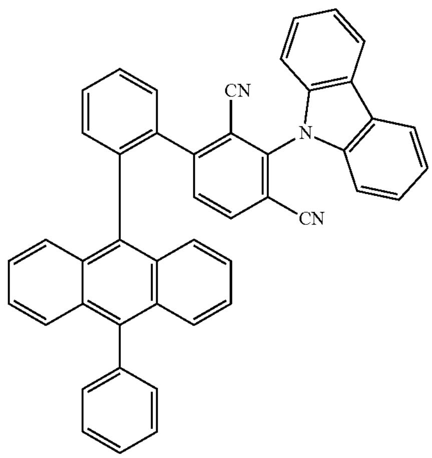
213
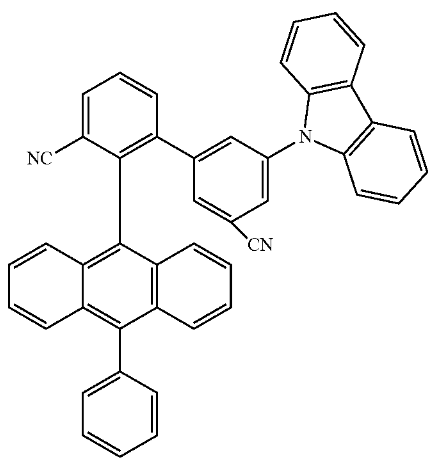
214
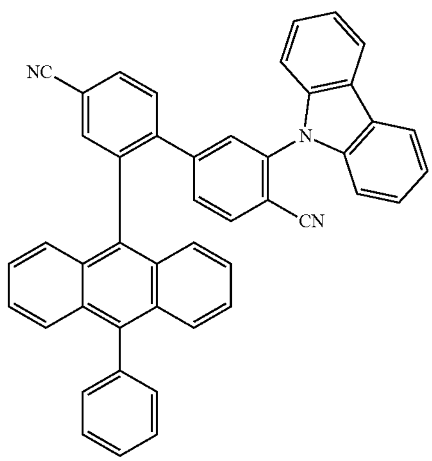

-continued
215
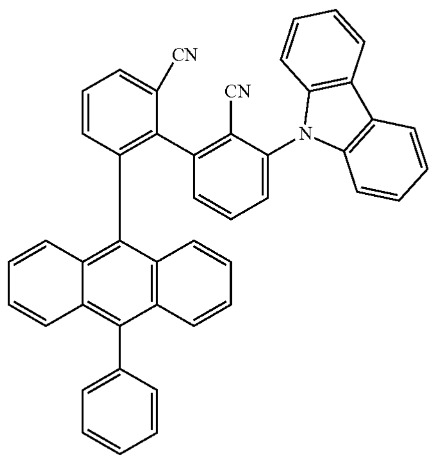
216
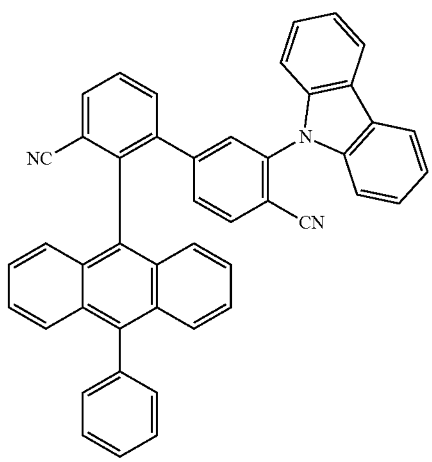
217
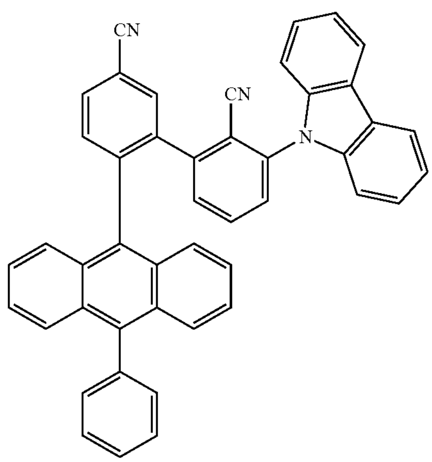

-continued
218
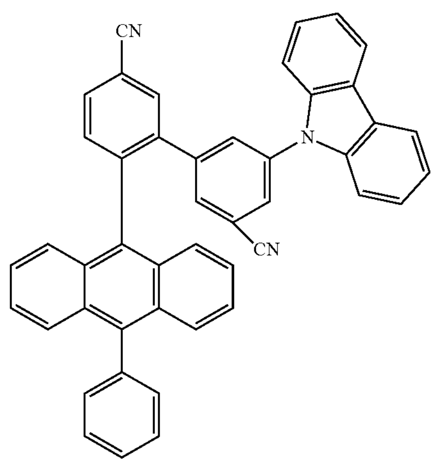
219
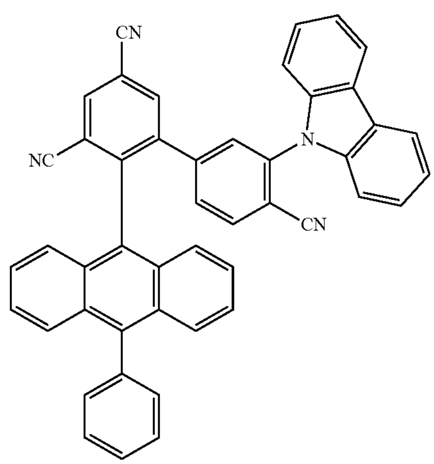
220
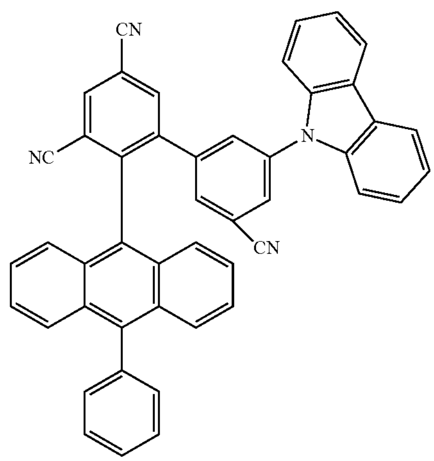

221
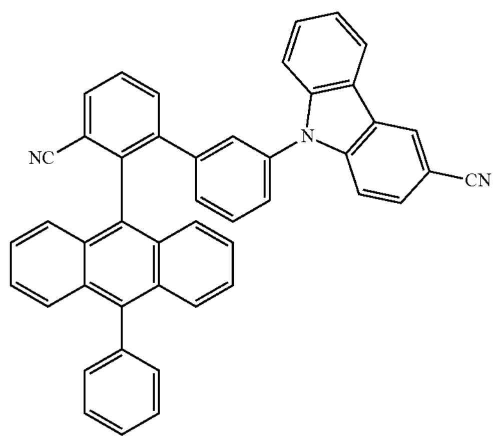
222
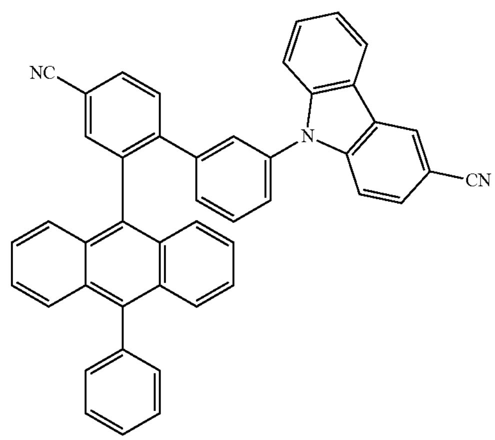
223
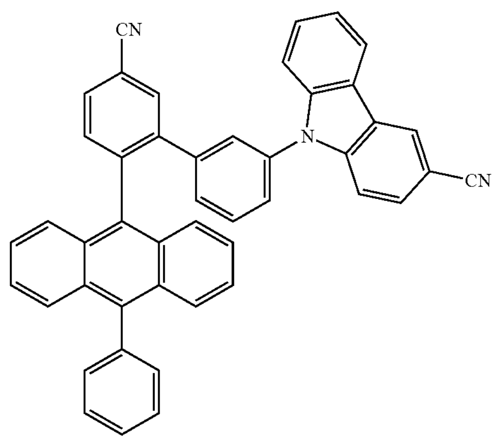
224
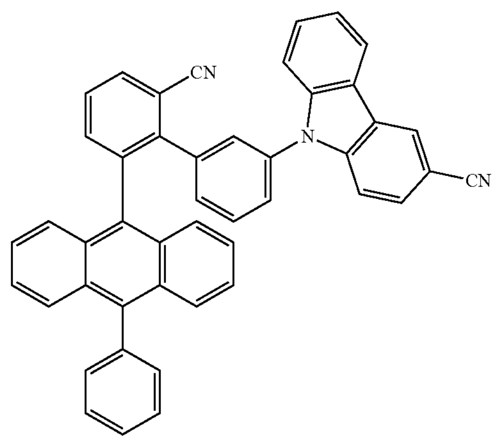
225
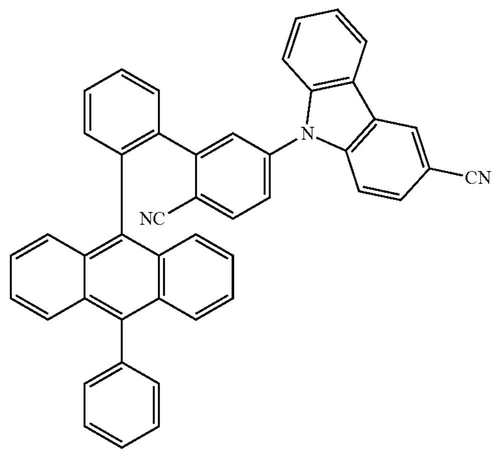
226
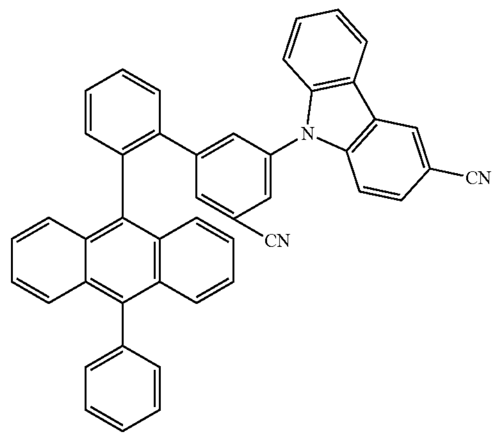

-continued
227
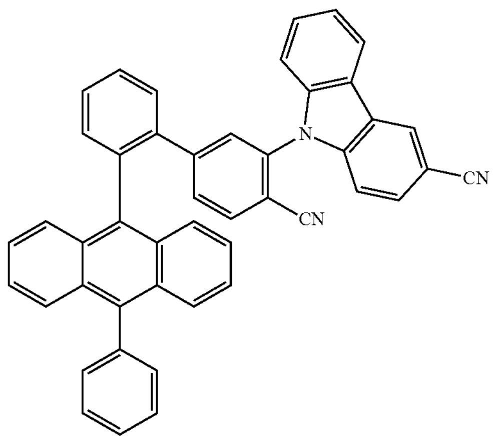
228
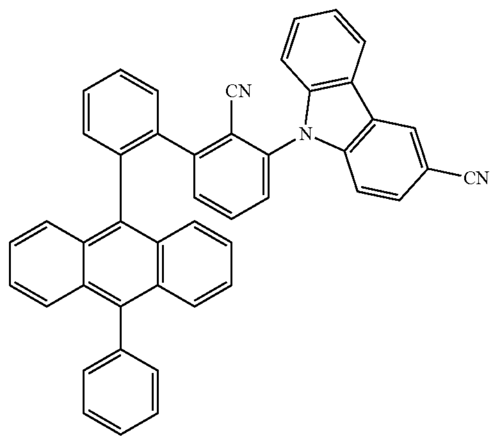
229
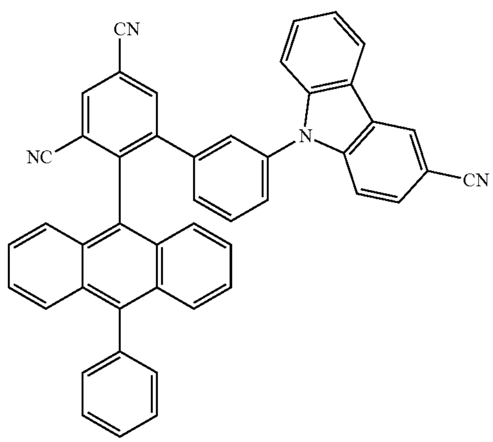
230
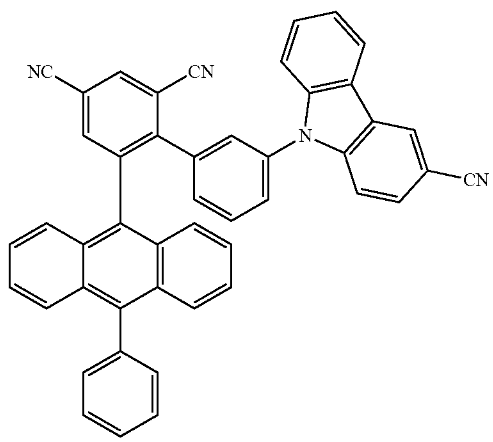
231
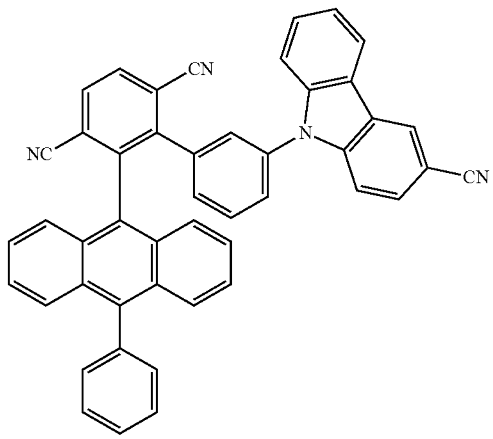
232
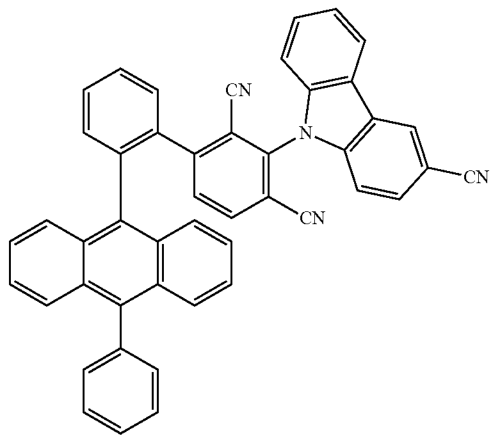

-continued
233
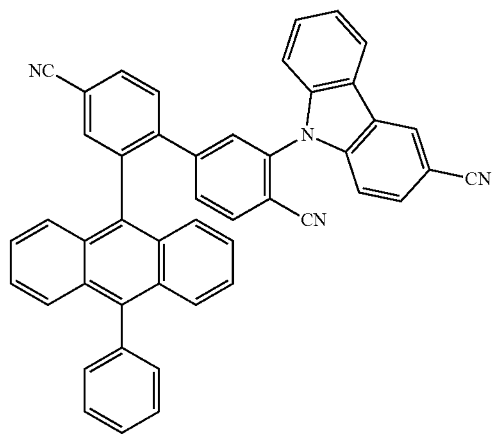
234
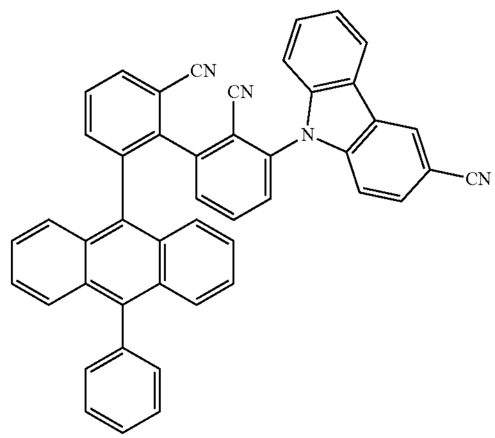
235
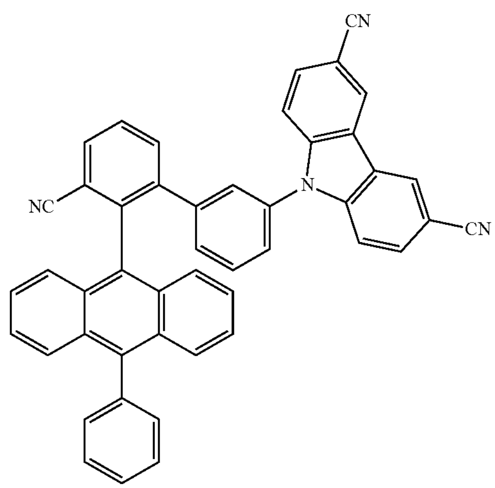
236
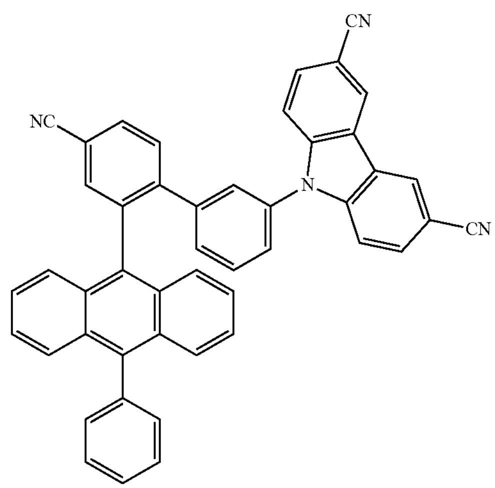
237
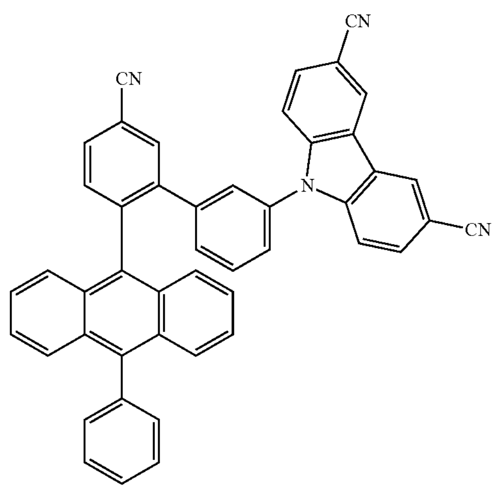
238
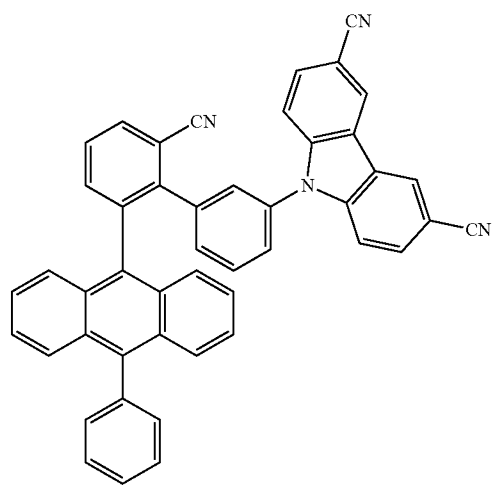

-continued
239
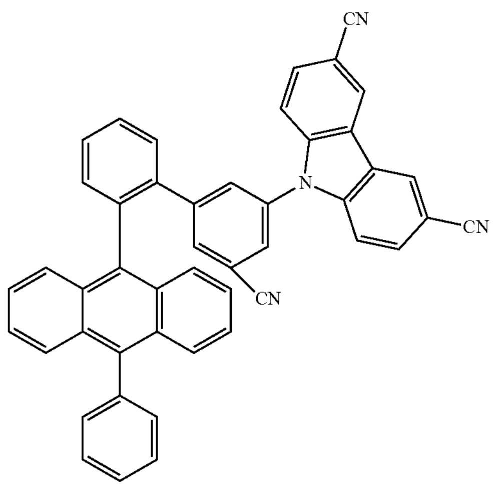
240
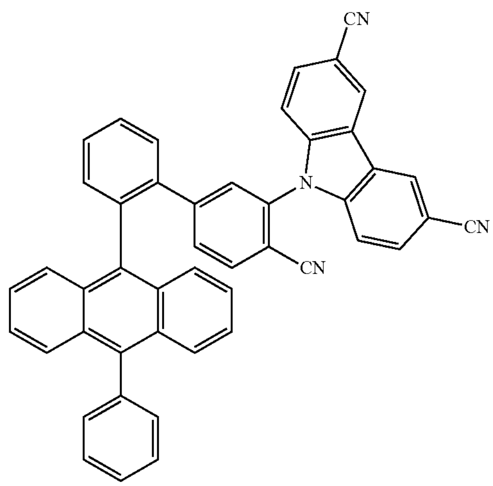
241
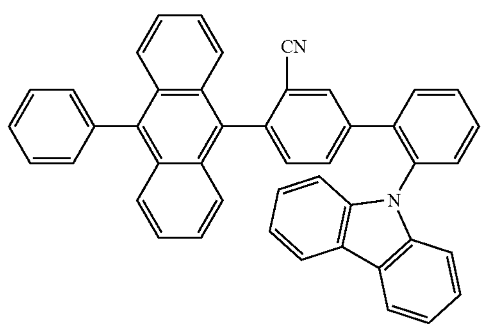
242
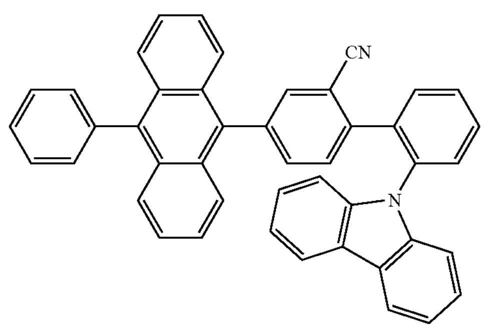
243
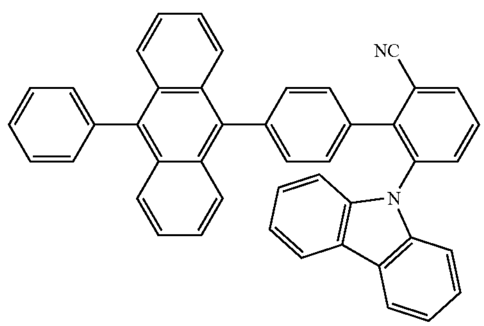
244
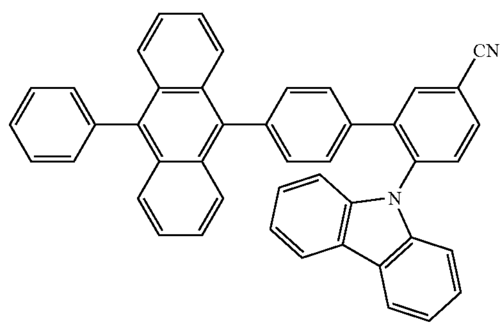
245
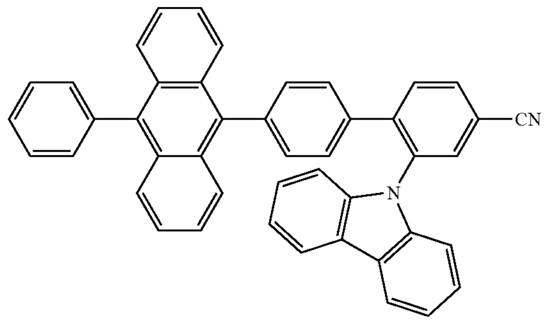
246
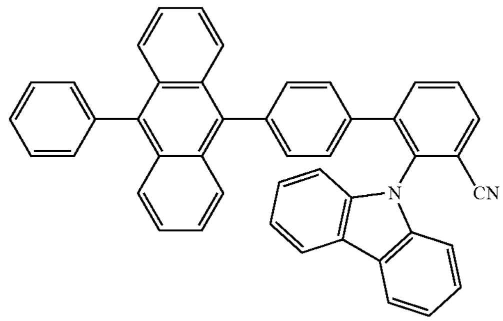

-continued
247
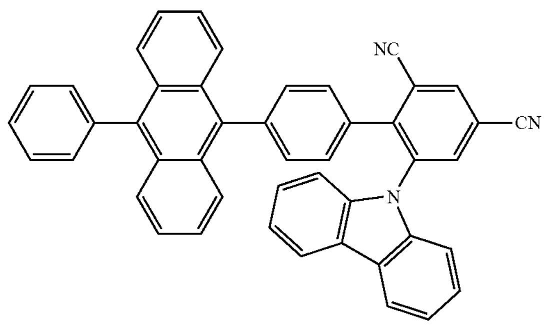
248
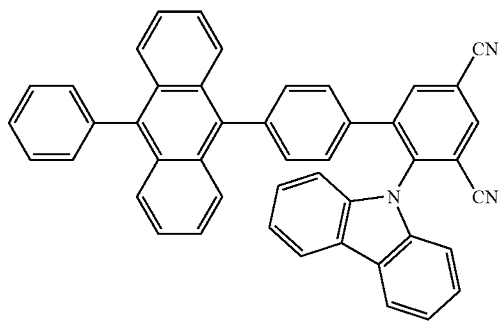
249
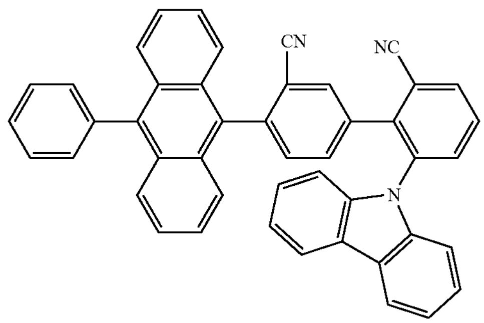
250
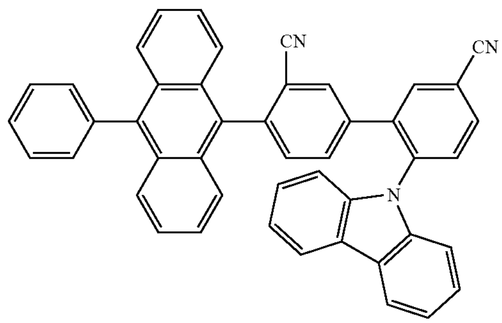
251
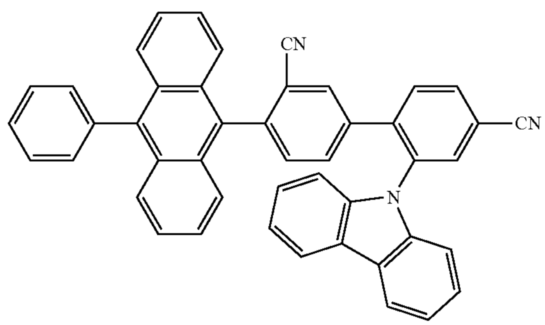
252
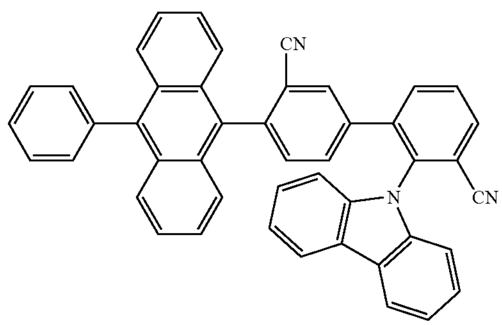
253
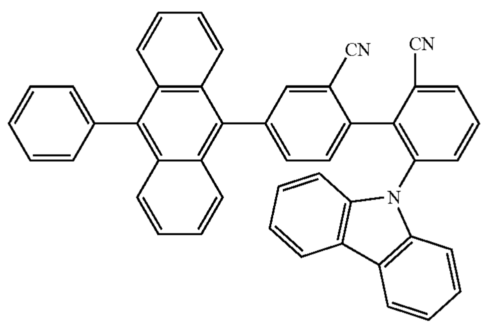
254
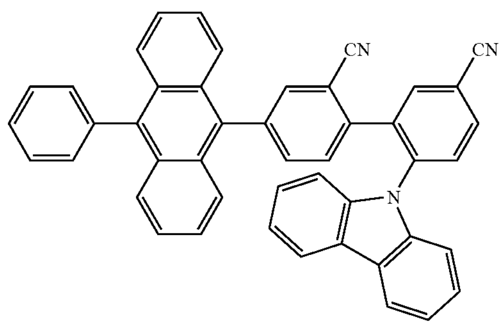

-continued
255
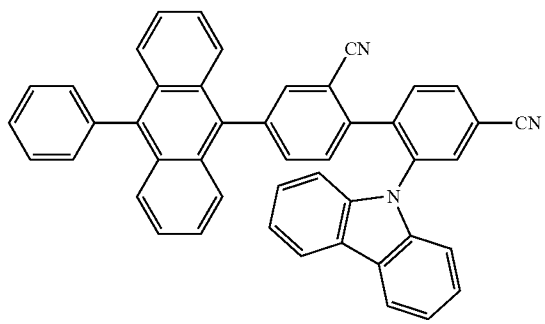
256
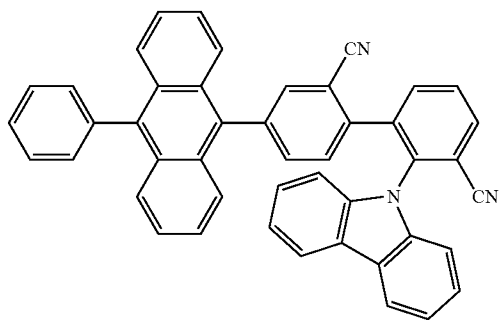
257
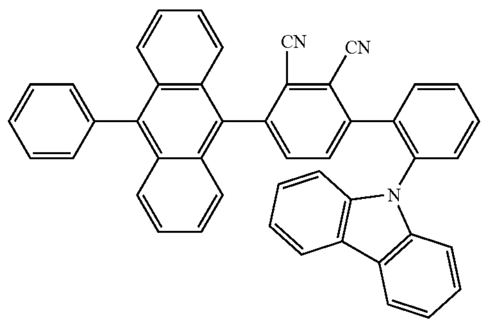
258
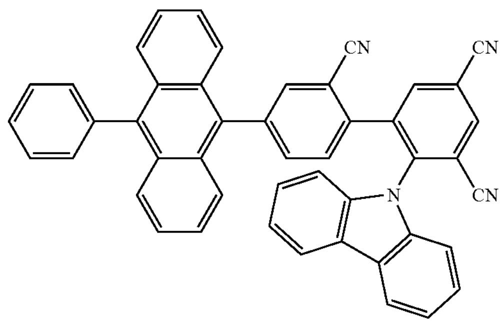
259
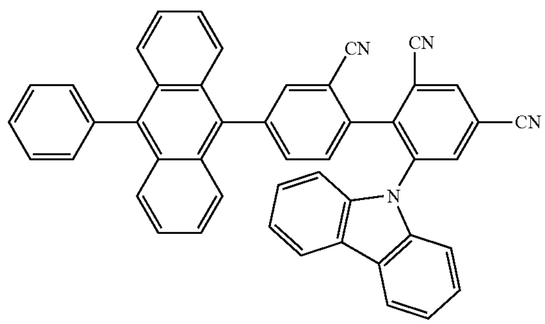
260
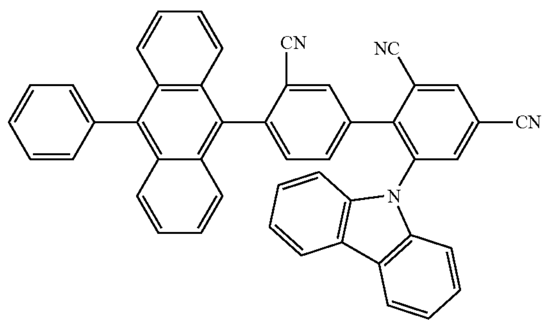
261
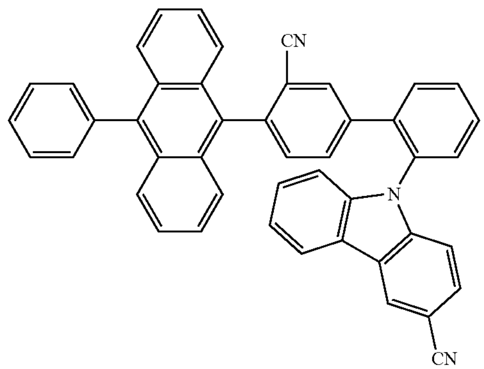
262
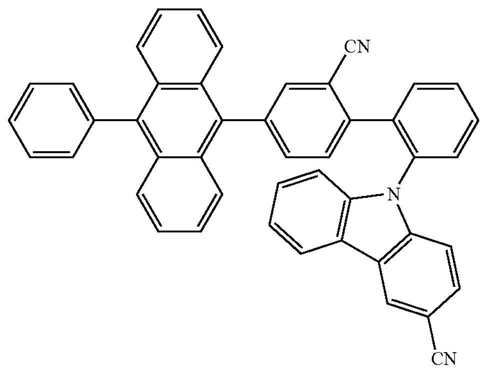

-continued
263
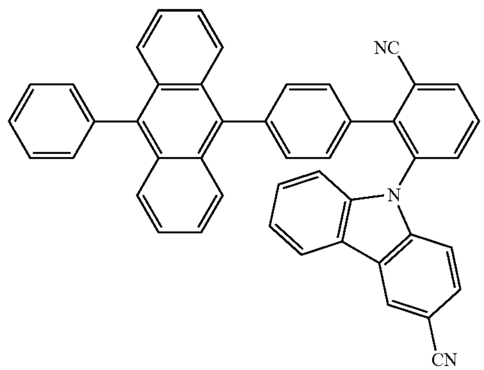
264
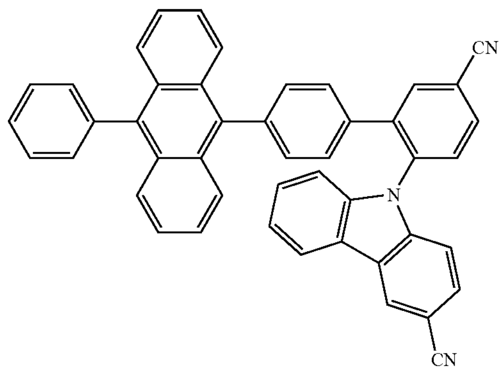
265
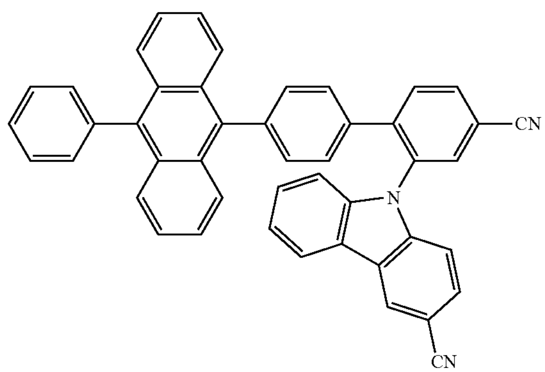
266
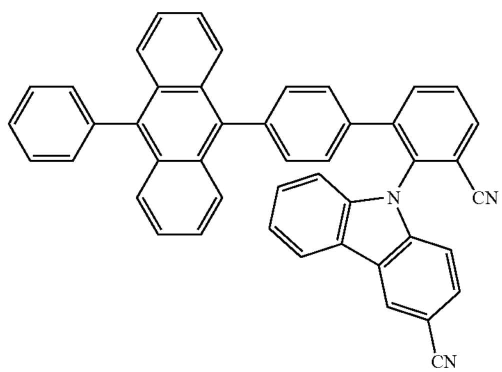
267
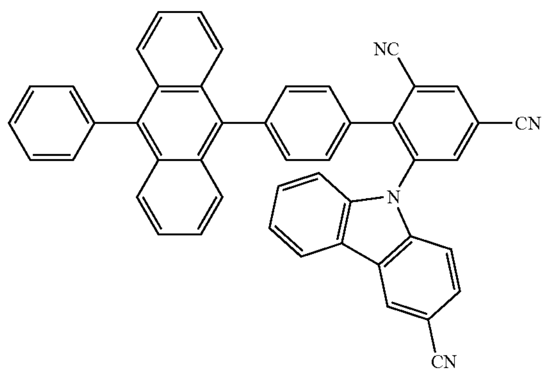
268
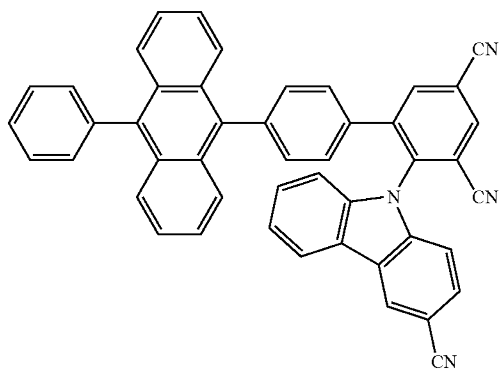
269
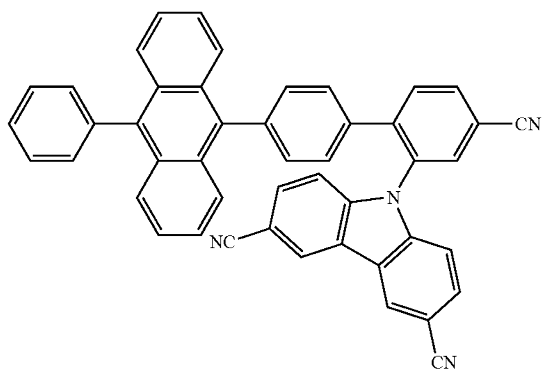
270
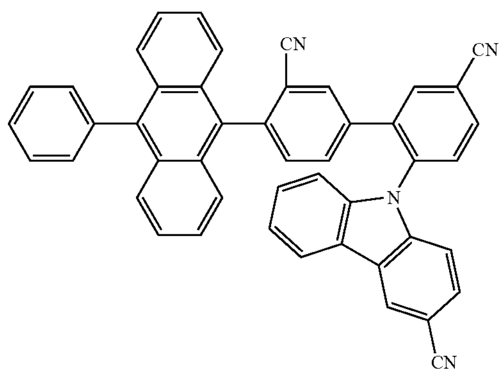

-continued
271
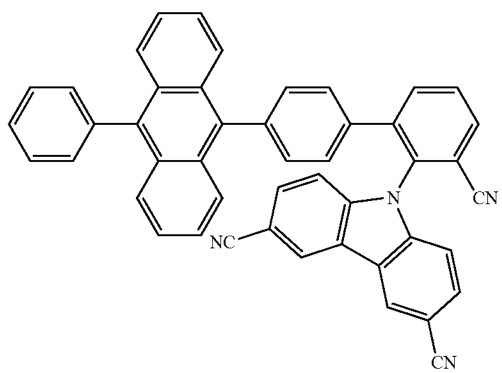
272
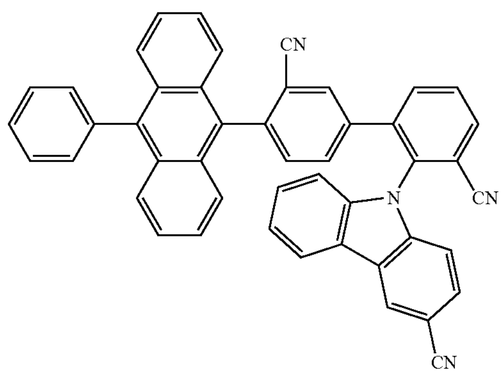
273
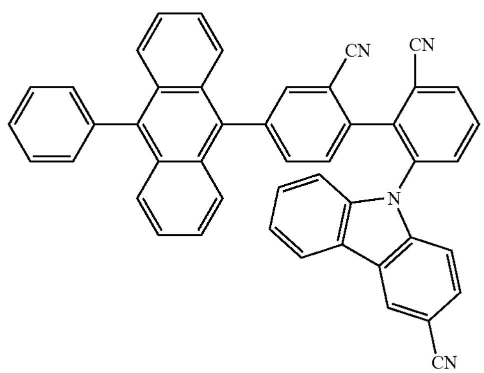
274
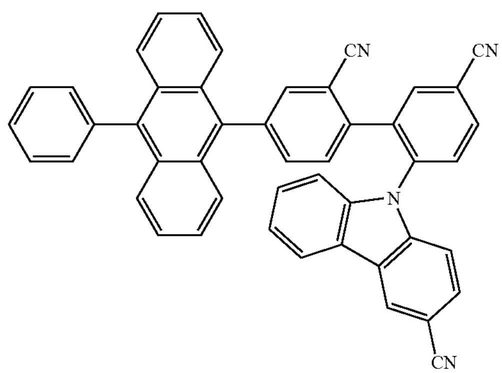
275
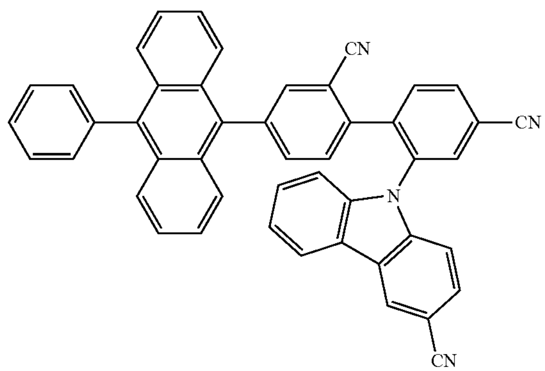
276
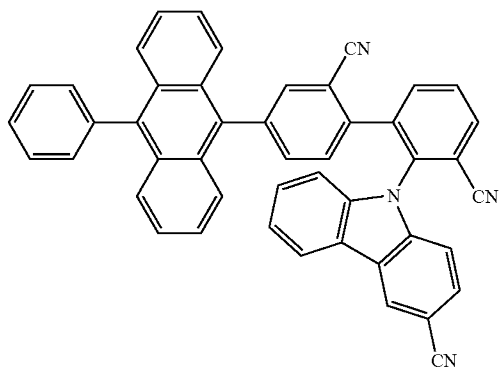
277
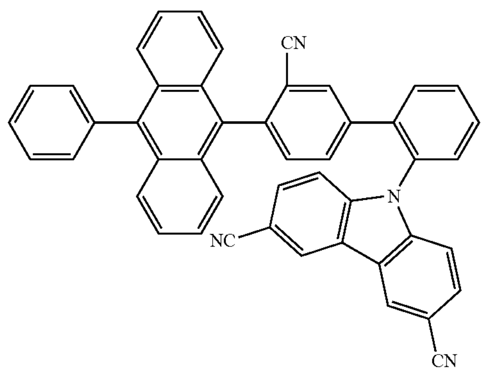
278
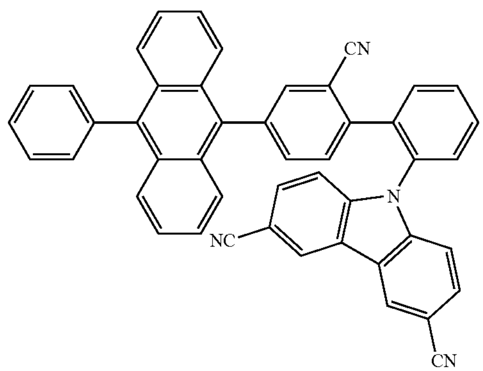

-continued
279
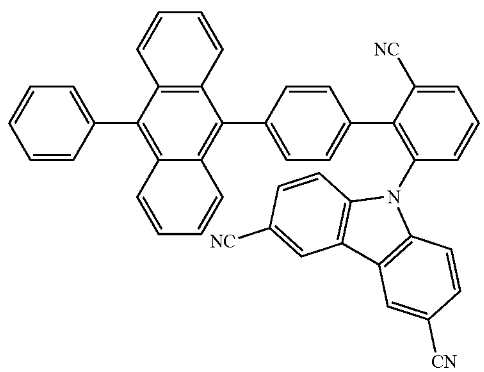
280
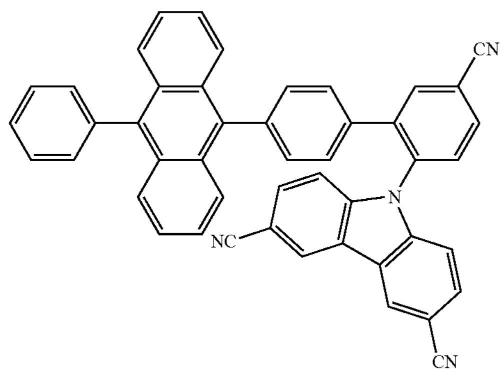
281
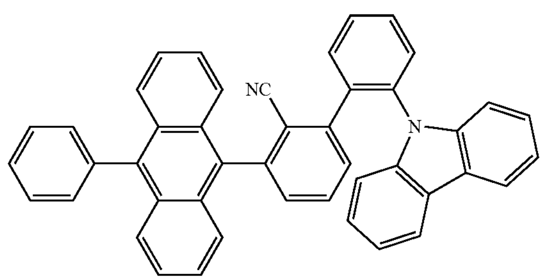
282
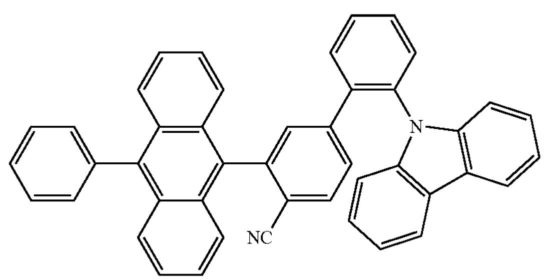
283
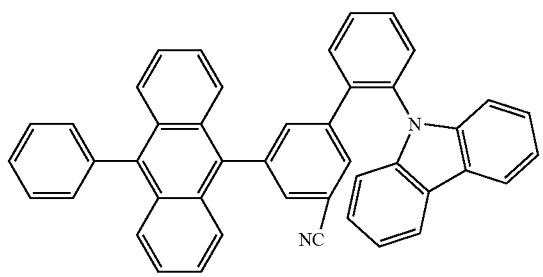
284
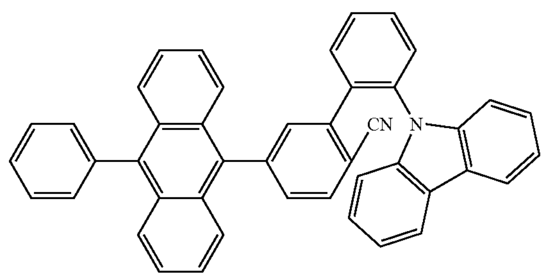
285
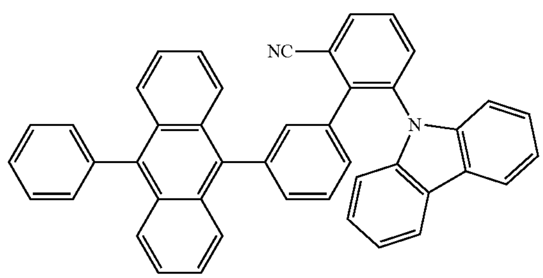
286
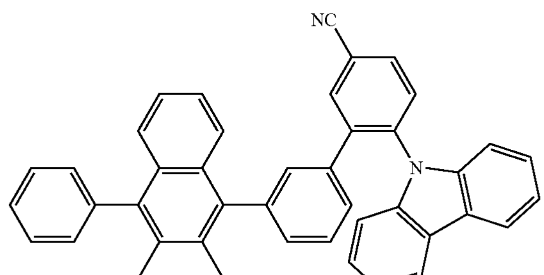
287
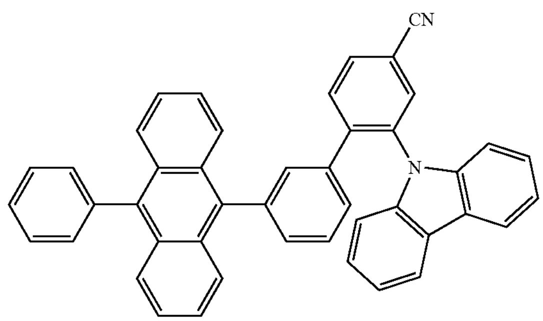
288
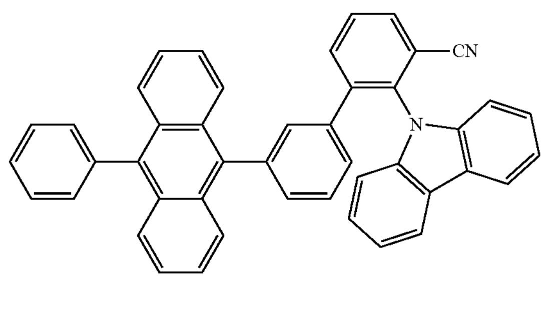

-continued
289
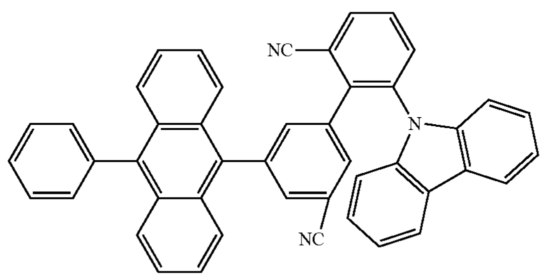
290
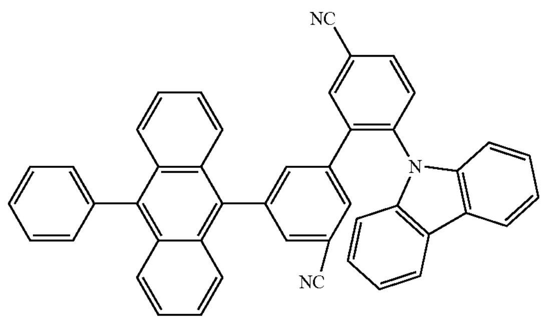
291
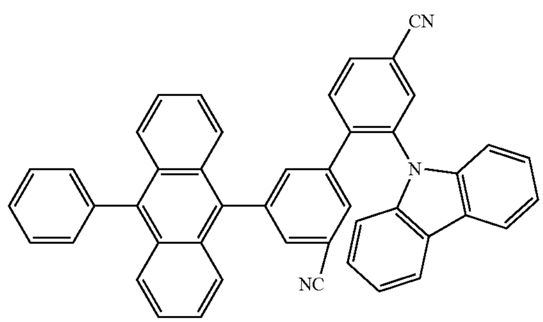
292
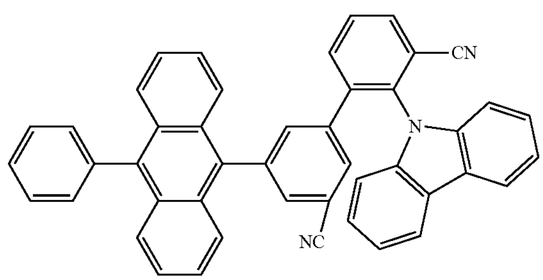
293
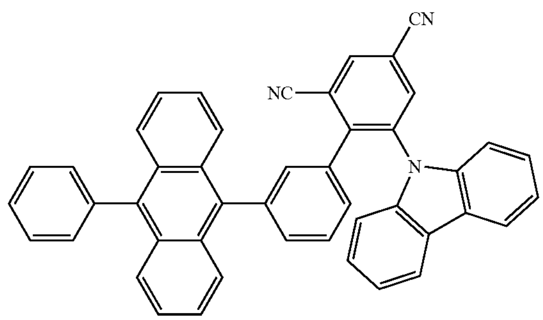
294
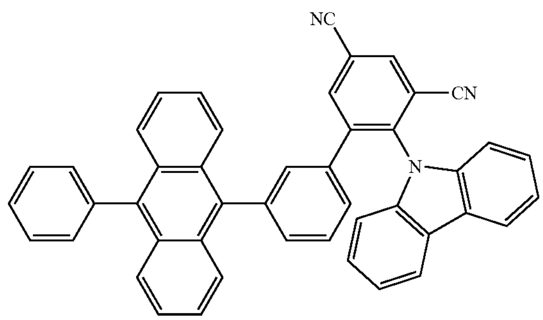
295
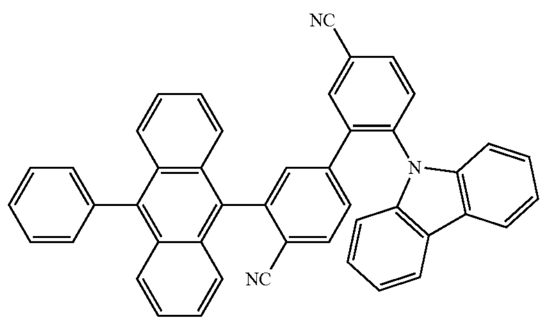
296
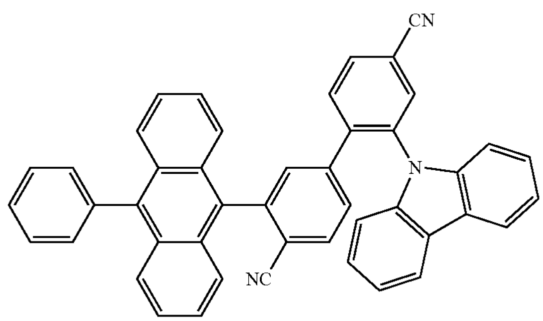
297
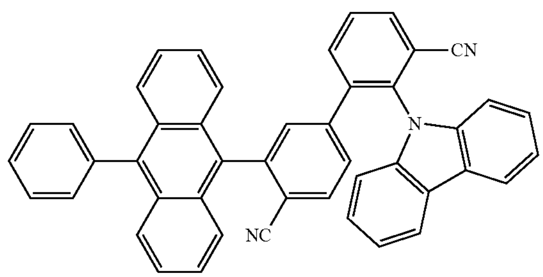
298
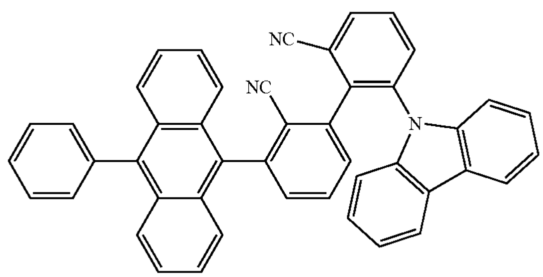

-continued
299
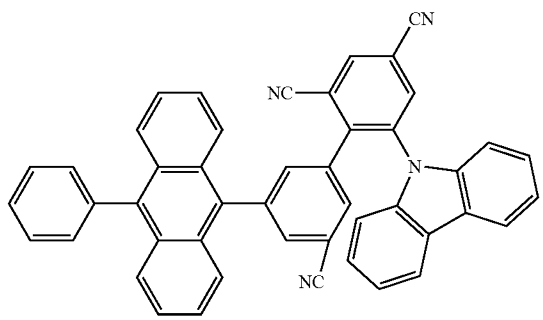
300
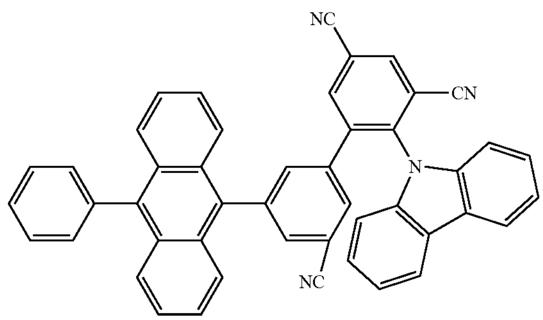
301
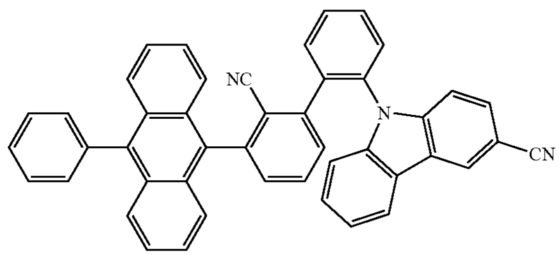
302
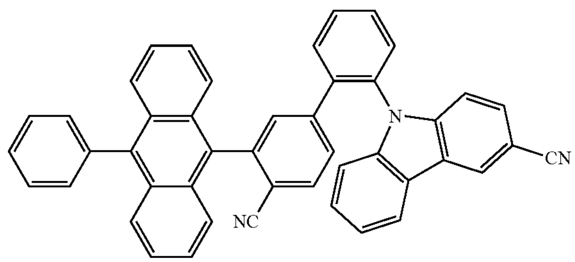
303
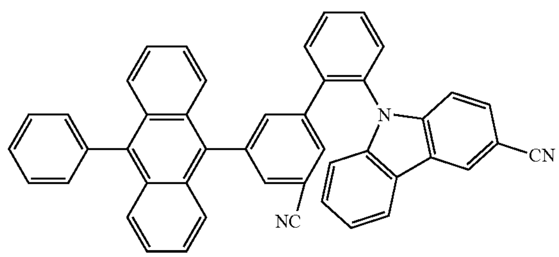
304
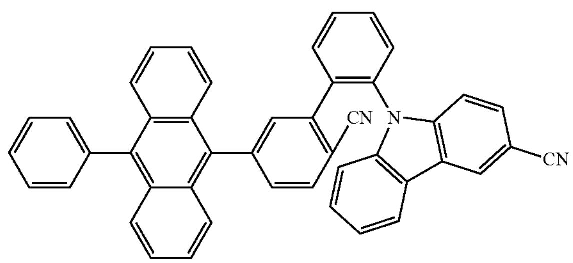
305
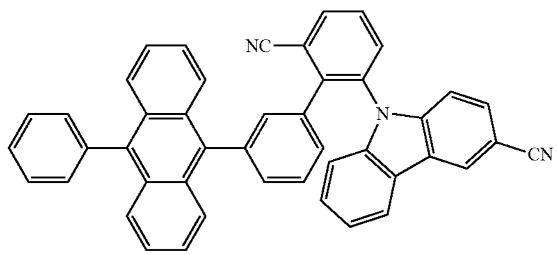
306
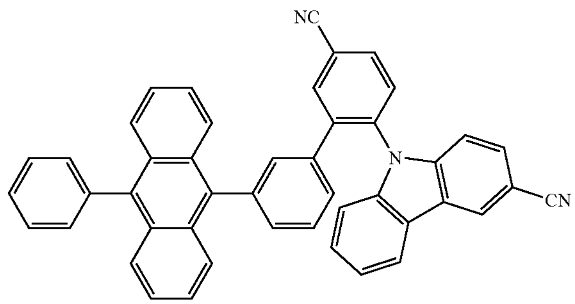
307
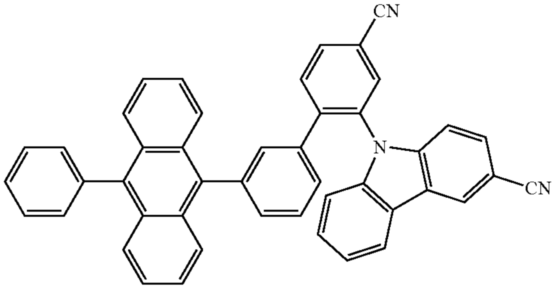
308
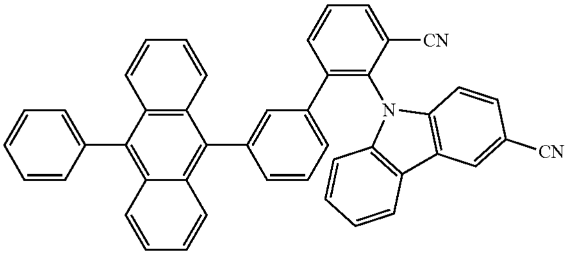

-continued
309
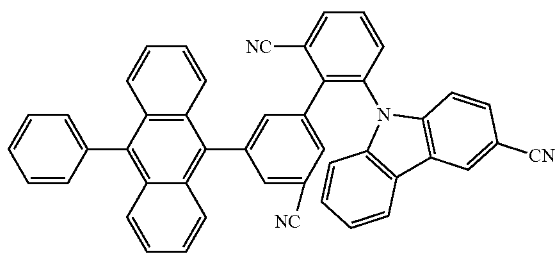
310
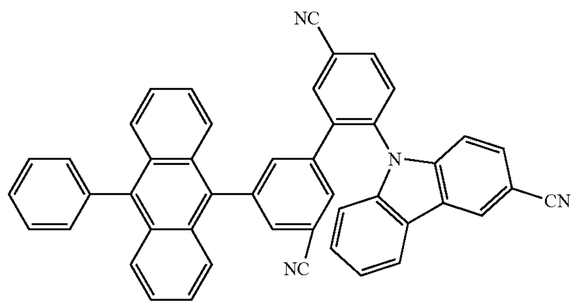
311
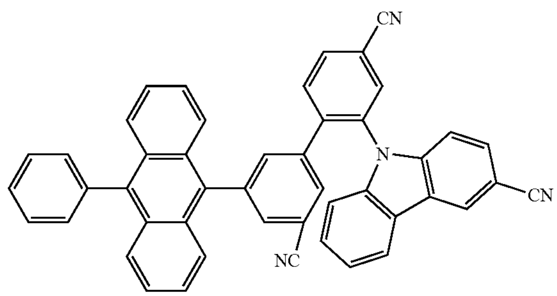
312
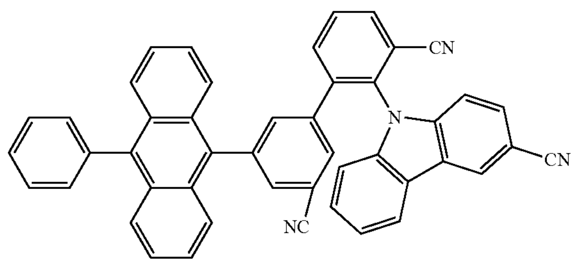
313
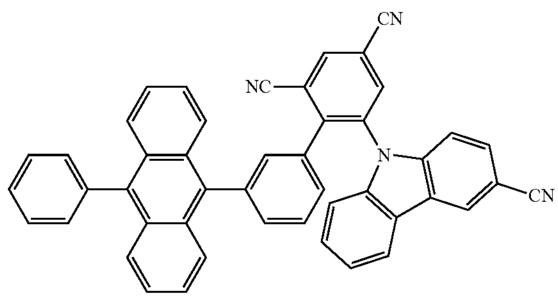
314
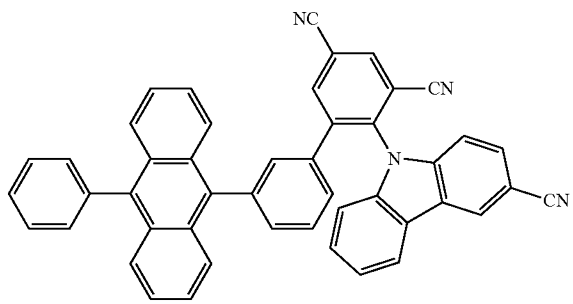
315
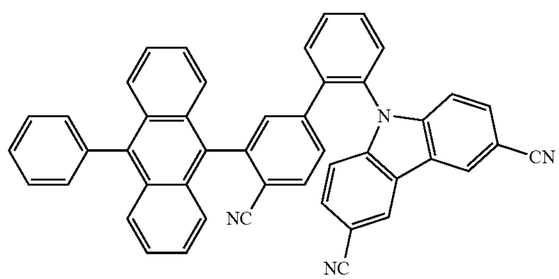
316
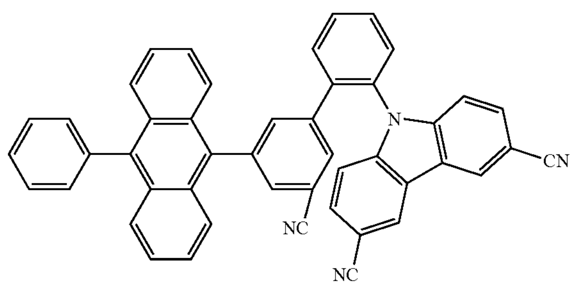
317
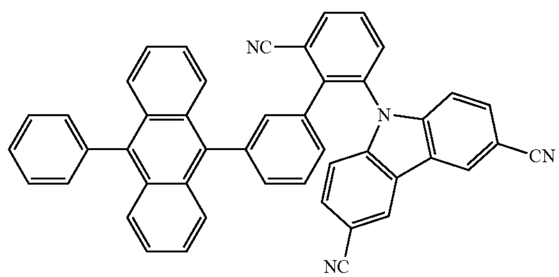
318
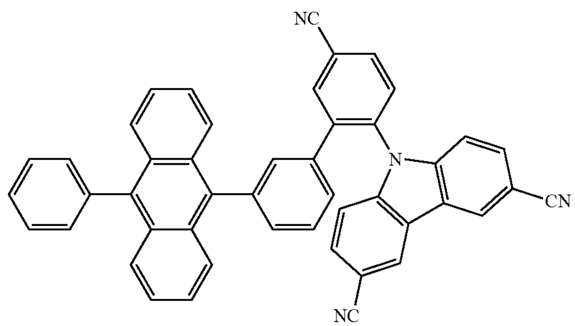

-continued
319
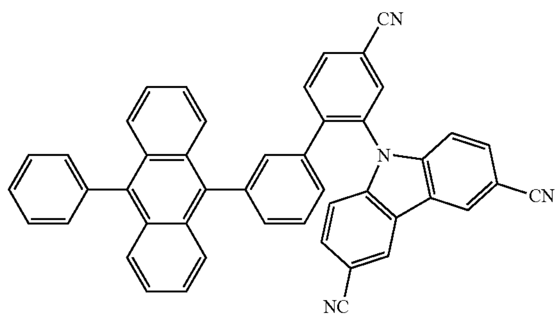
320
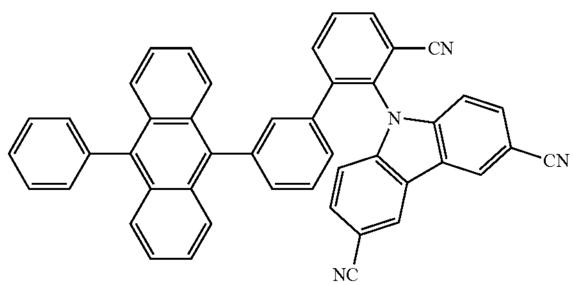
321
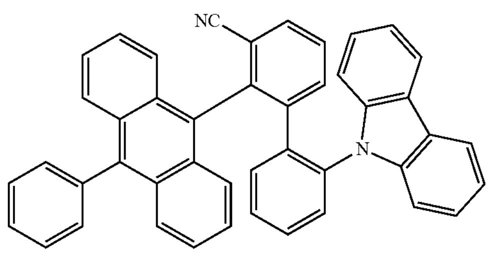
322
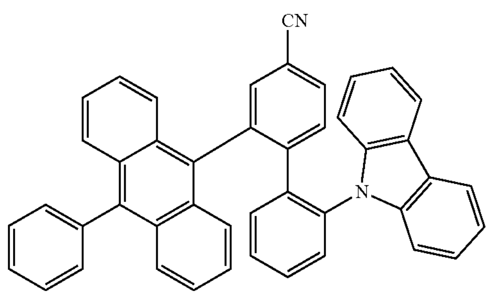
323
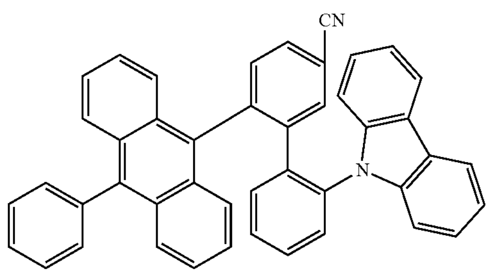
324
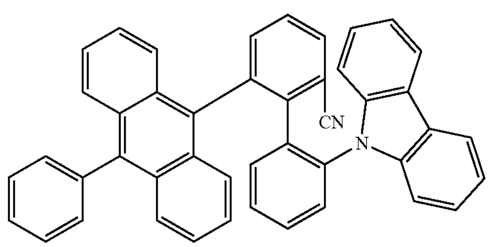
325
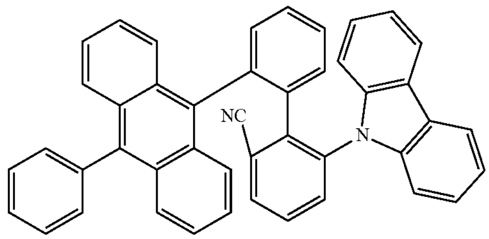
326
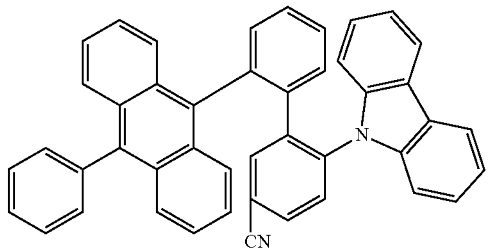
327
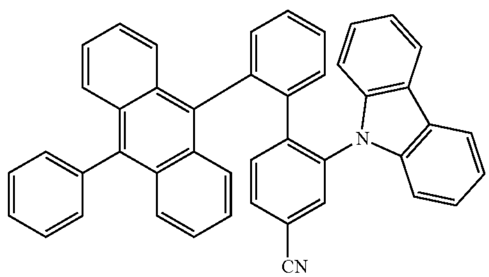
328
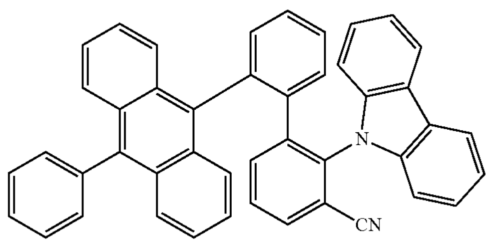

-continued
329
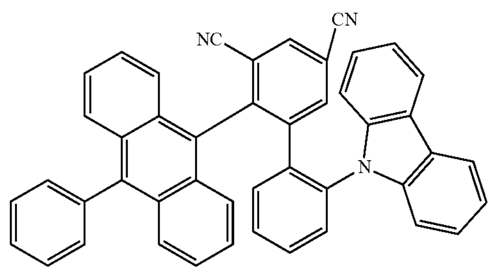
330
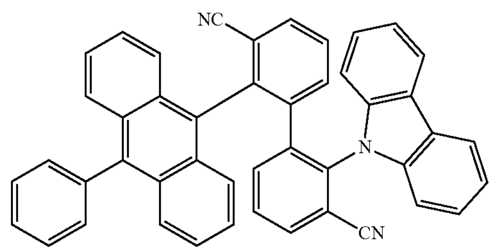
331
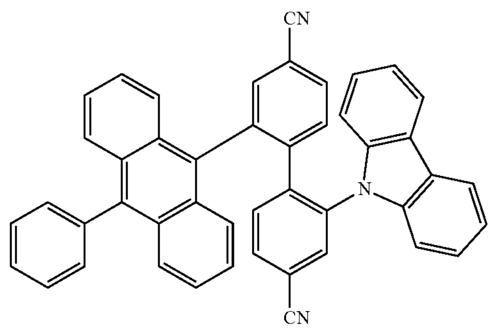
332
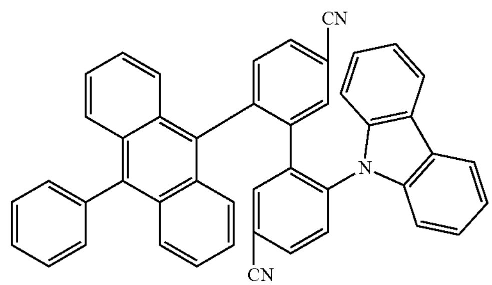
333
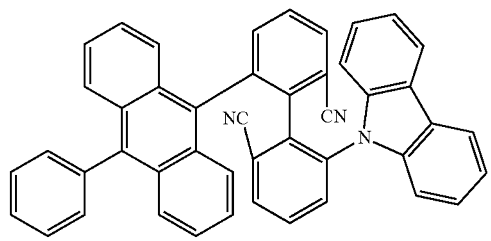
334
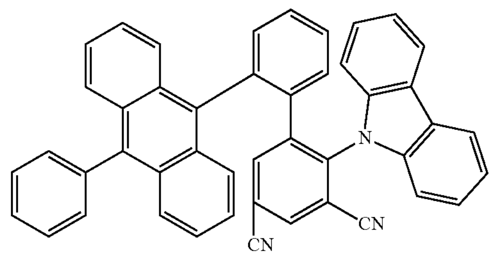
335
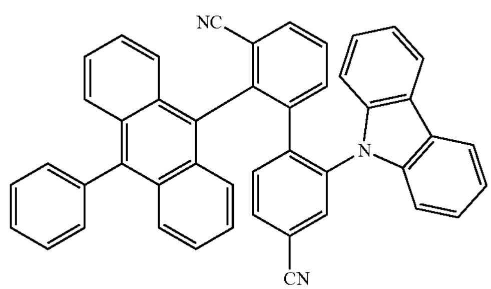
336
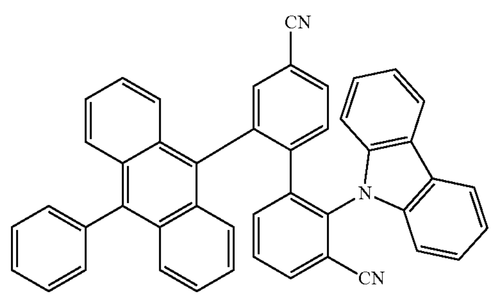
337
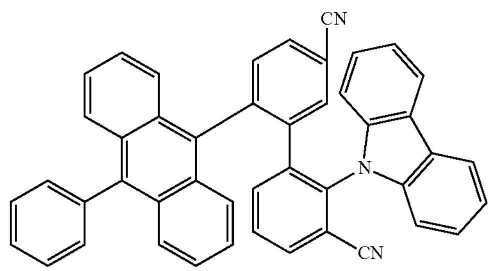
338
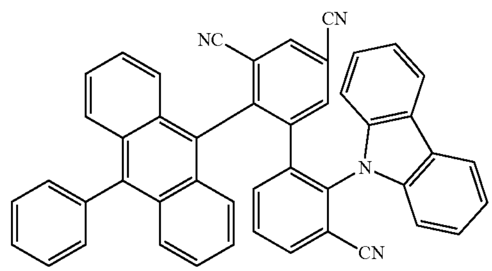

-continued
339
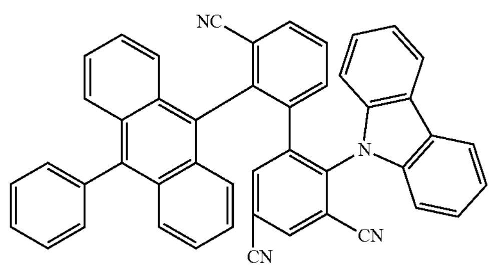
340
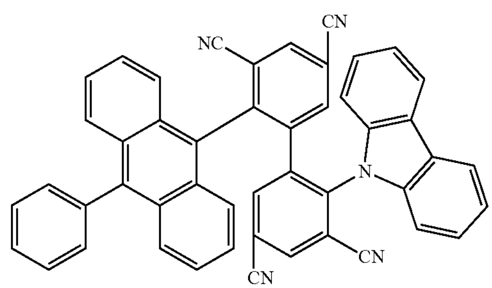
341
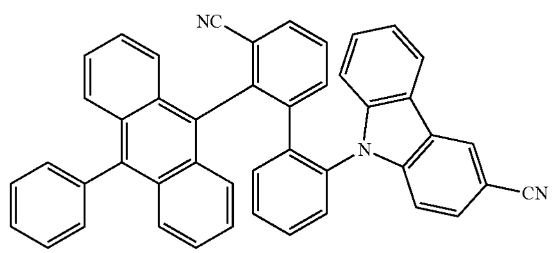
342
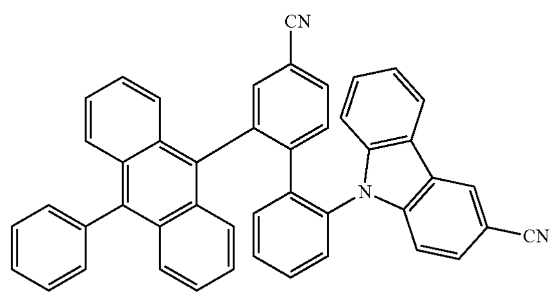
343
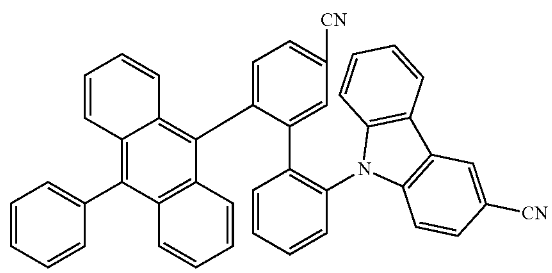
344
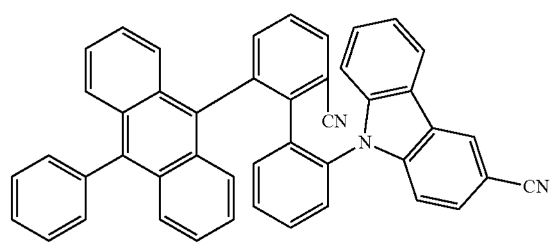
345
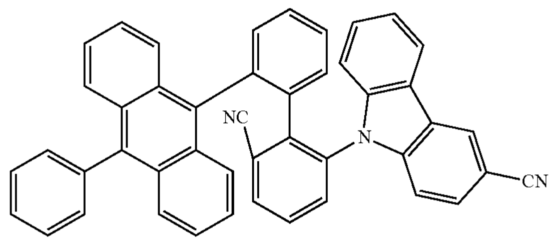
346
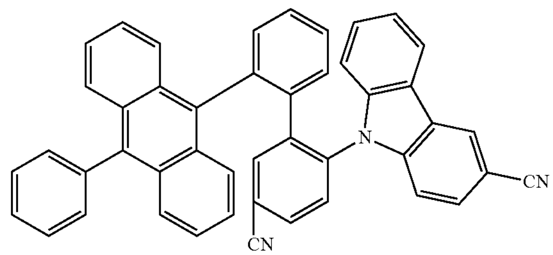
347
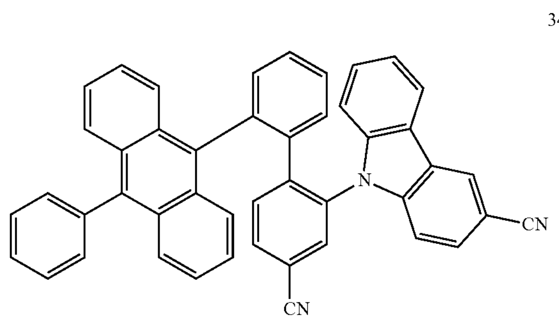
348
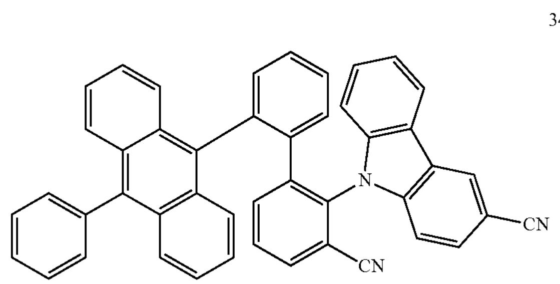

-continued
349
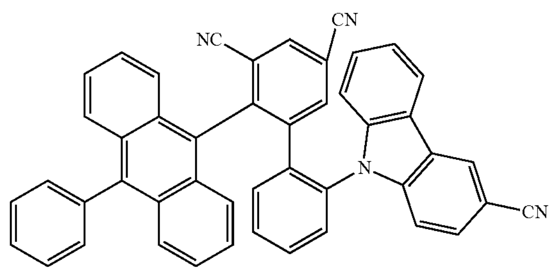
350
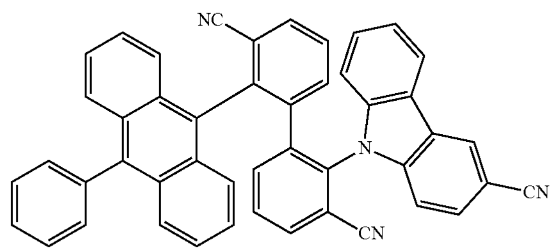
351
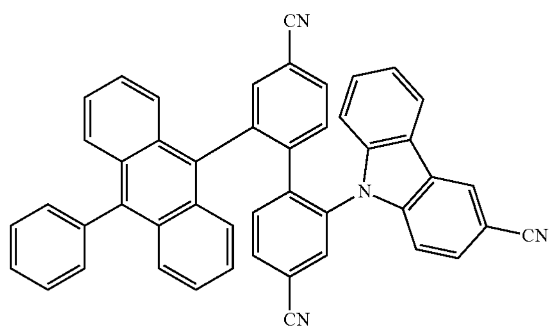
352
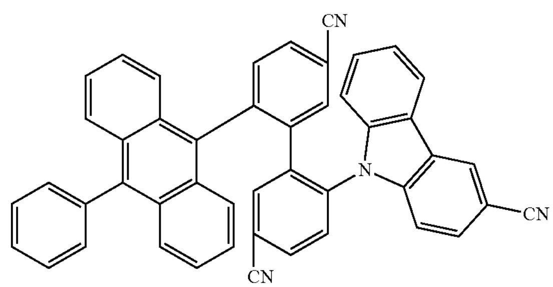
353
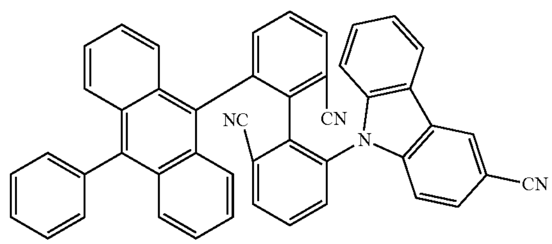
354
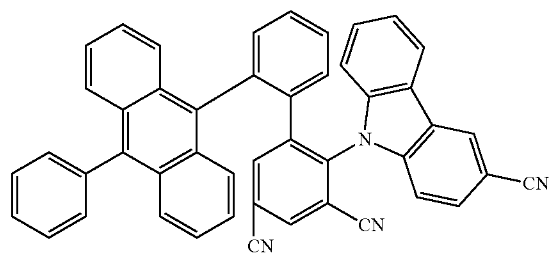
355
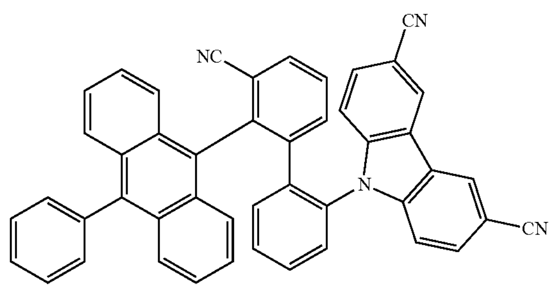
356
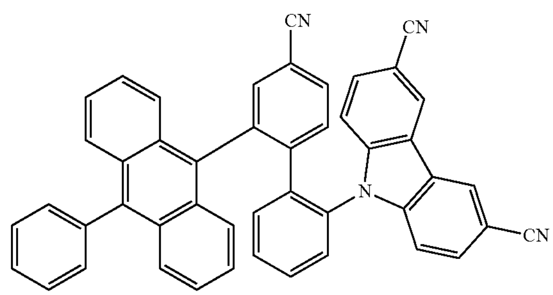
357
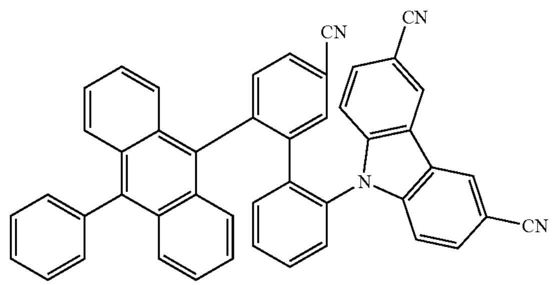
358
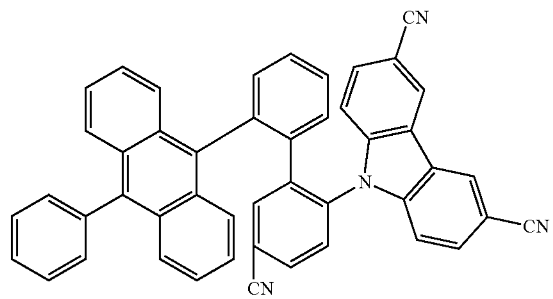

-continued
359
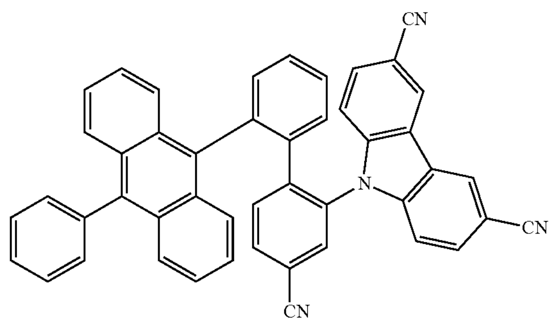
360
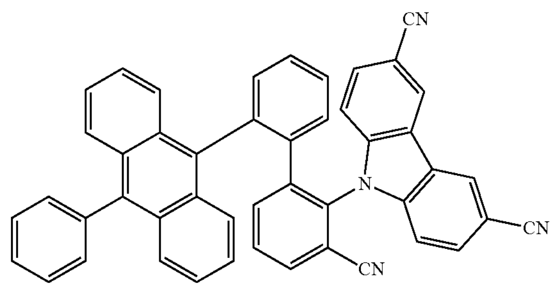
361
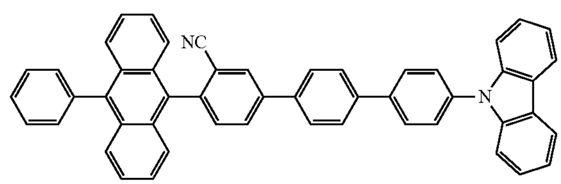
362
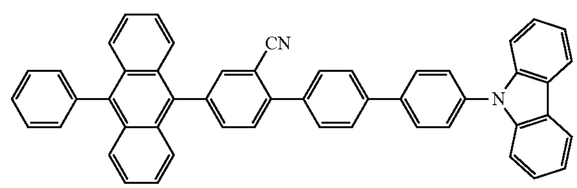
363
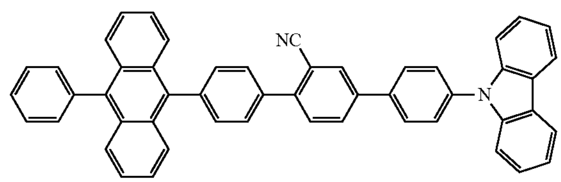
364
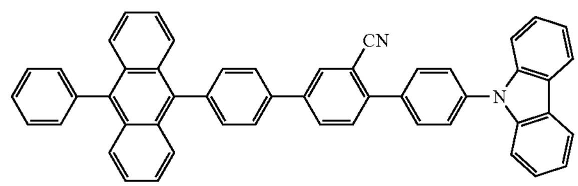
365
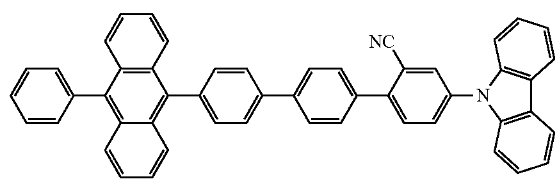
366
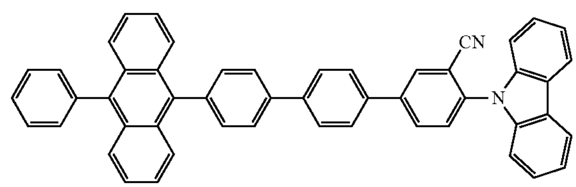
367
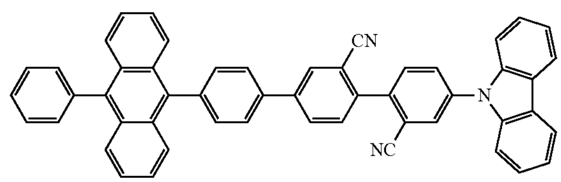
368
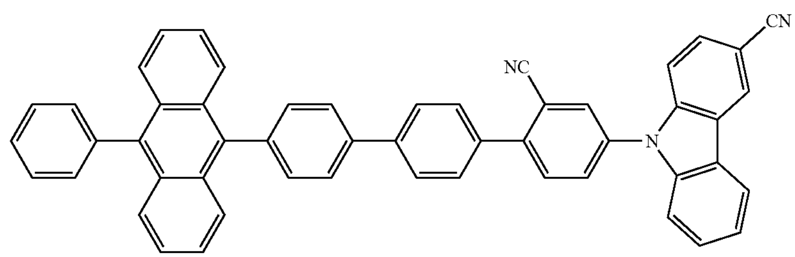

-continued
369
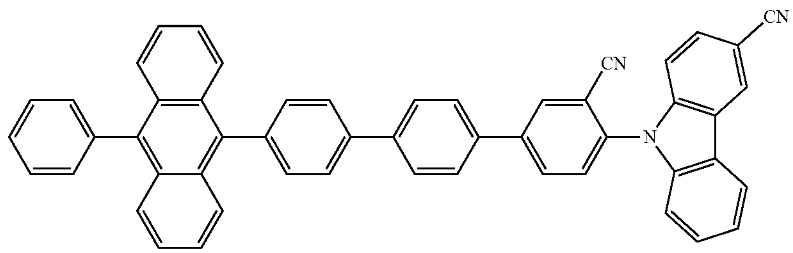
370
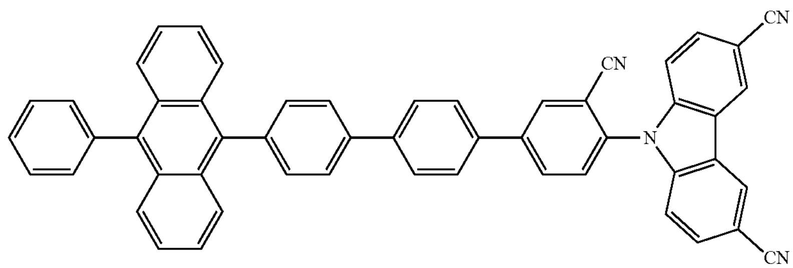
371
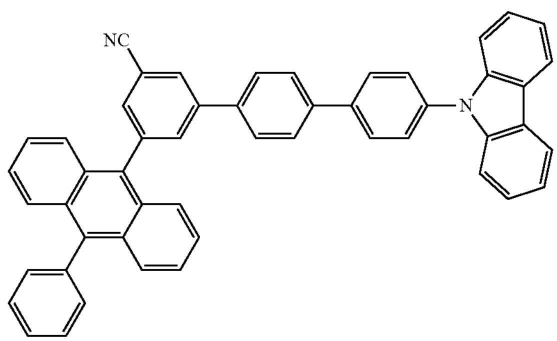
372
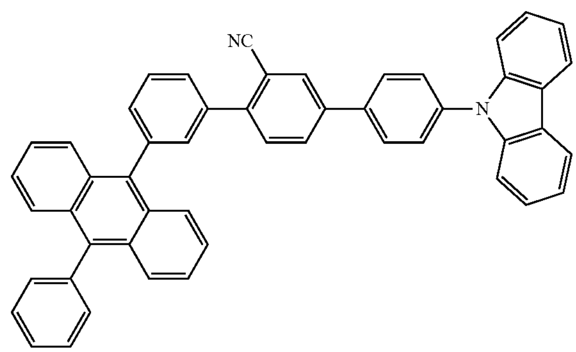
373
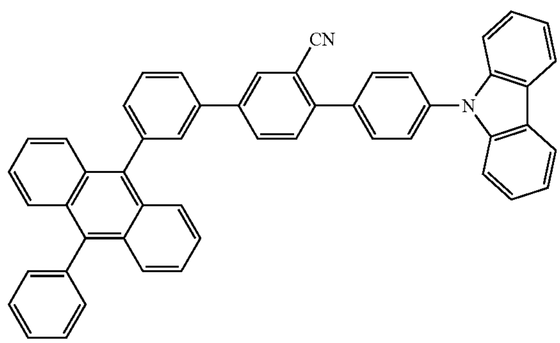
374
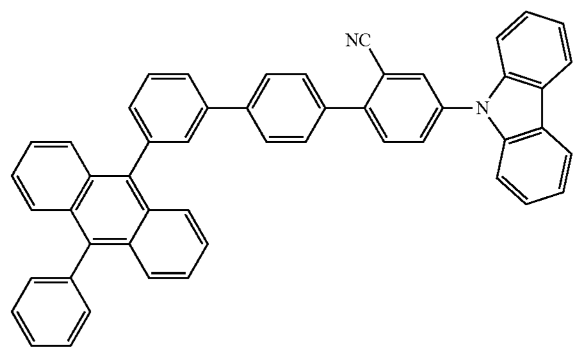
375
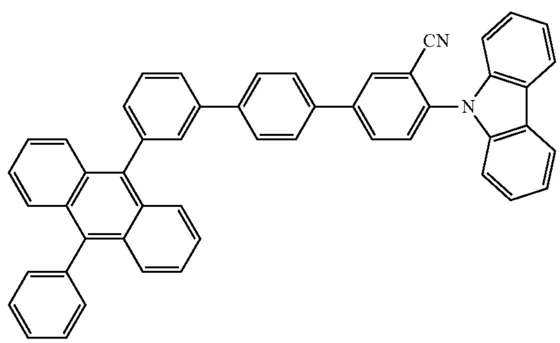
376
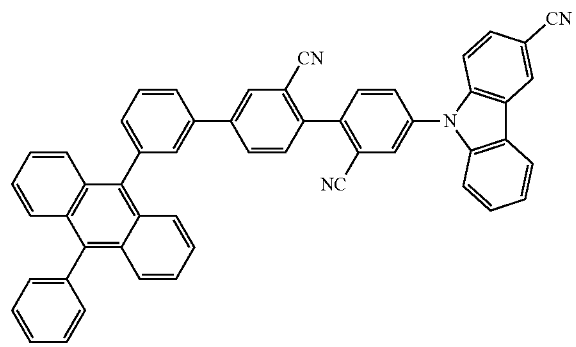

-continued
377
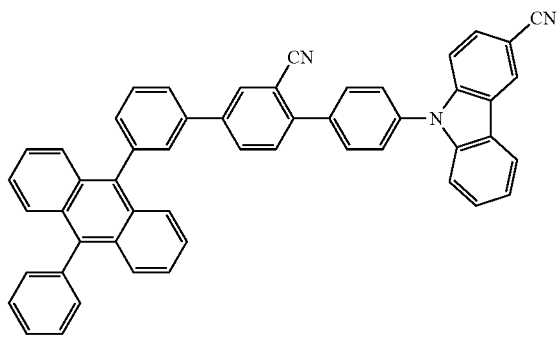
378
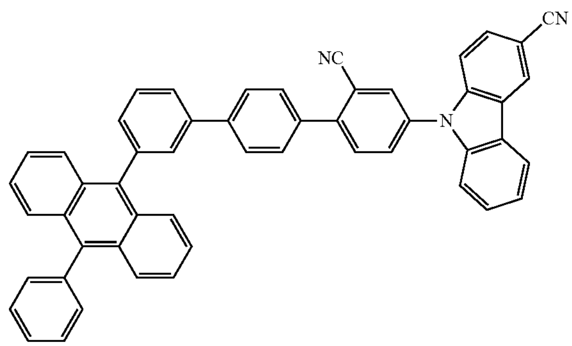
379
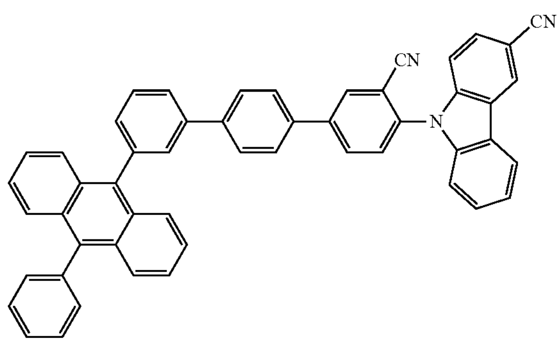
380
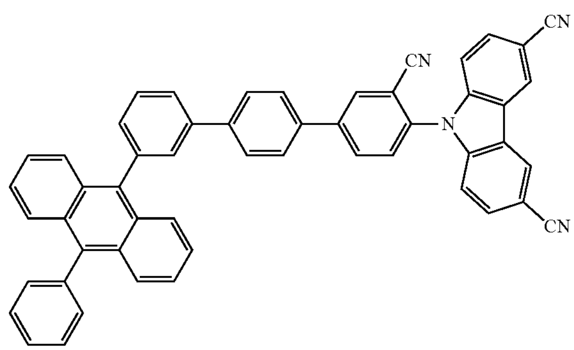
381
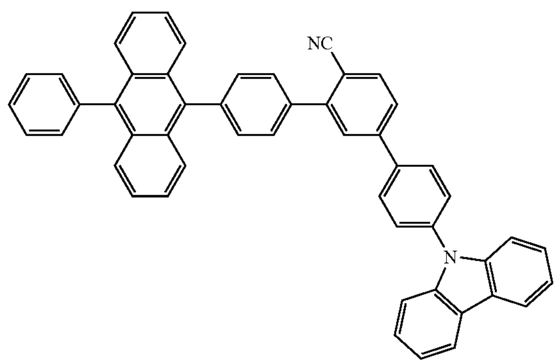
382
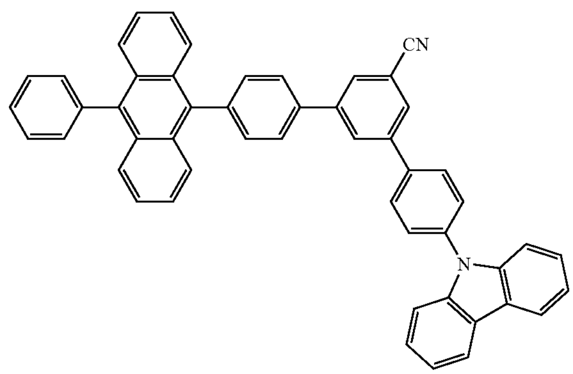
383
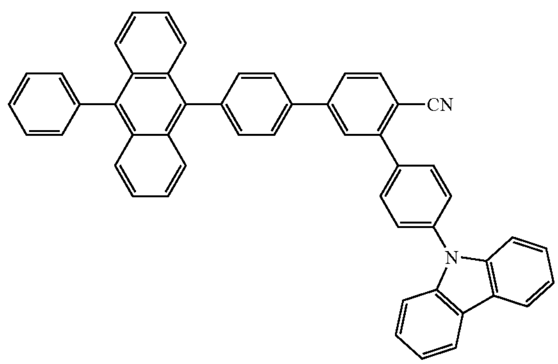
384
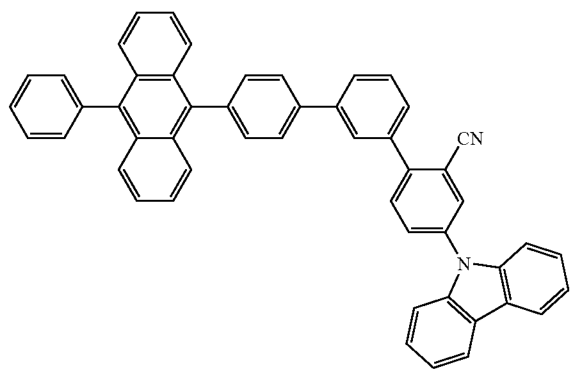

-continued
385
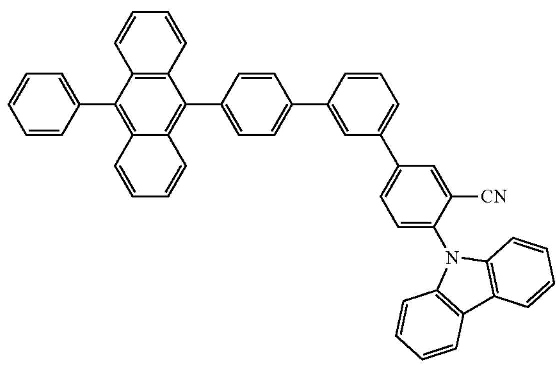
389
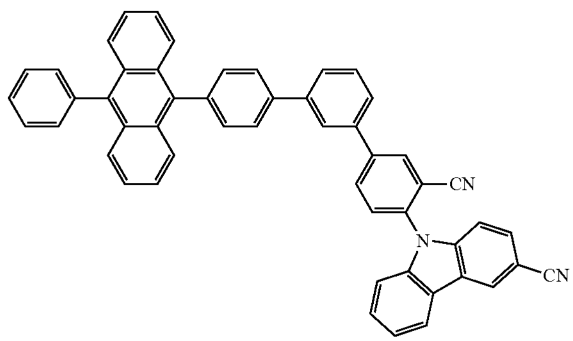
386
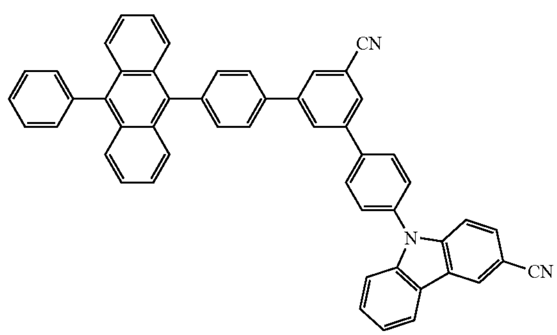
387
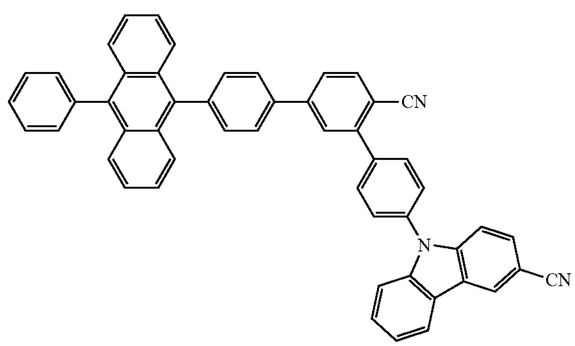
388
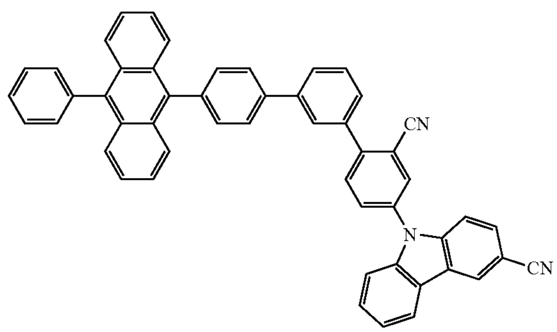
390
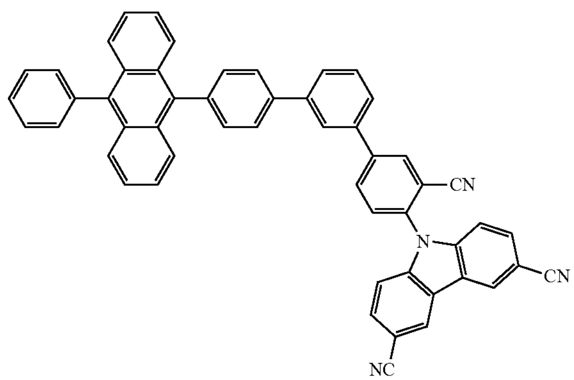
391
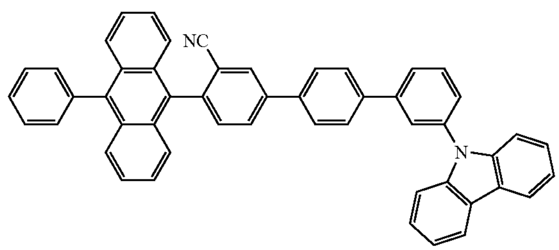
392
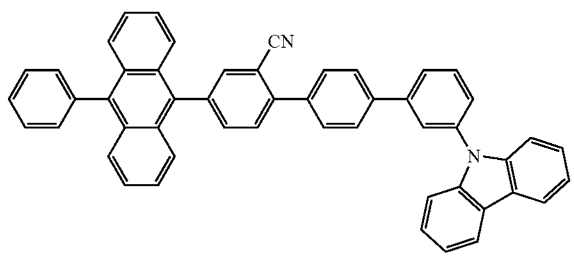

-continued
393
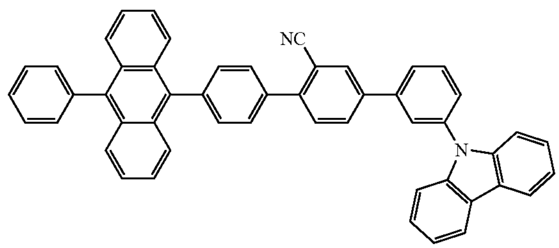
394
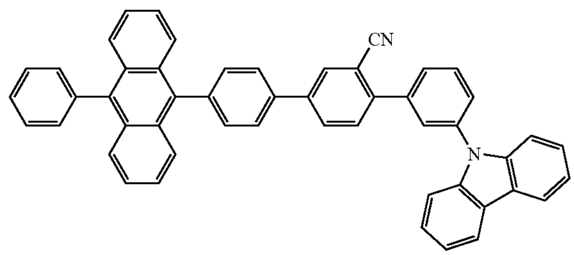
395
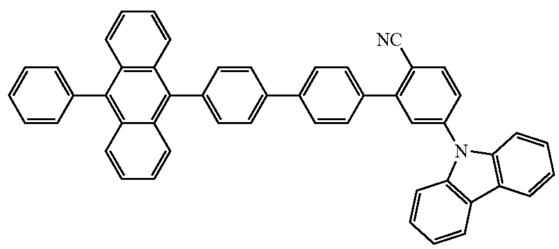
396
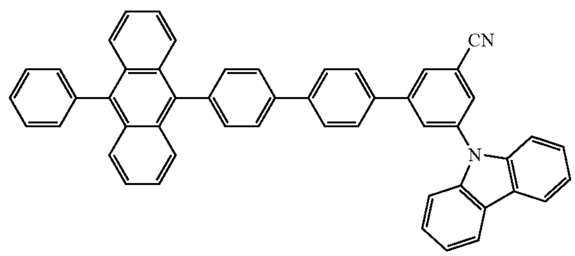
397
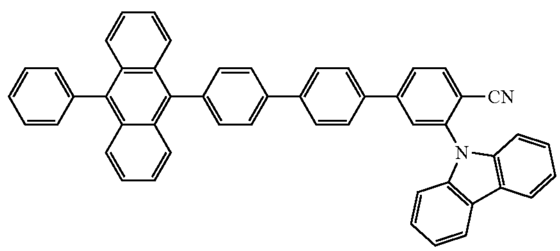
398
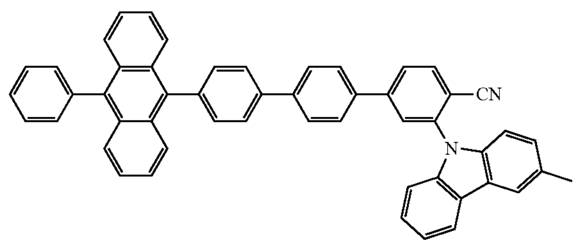
399
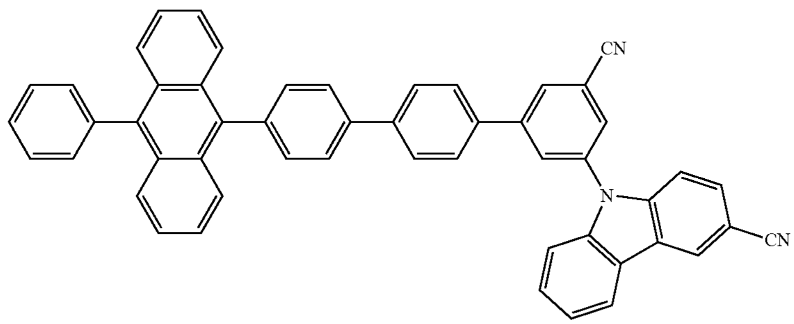
400
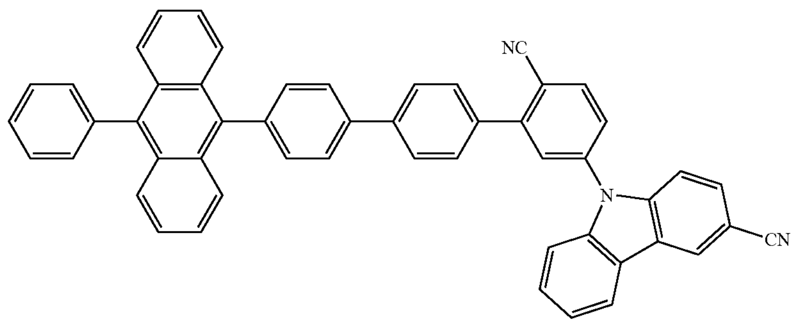

-continued
401
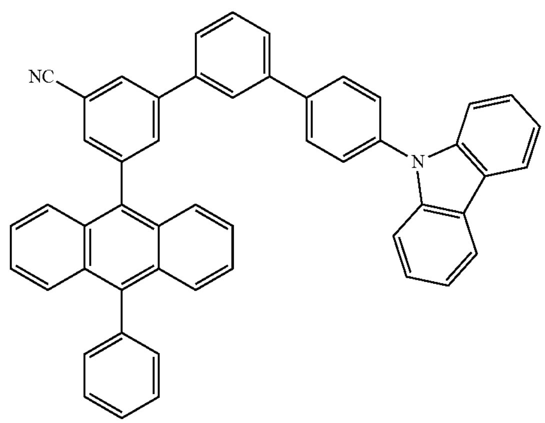
402
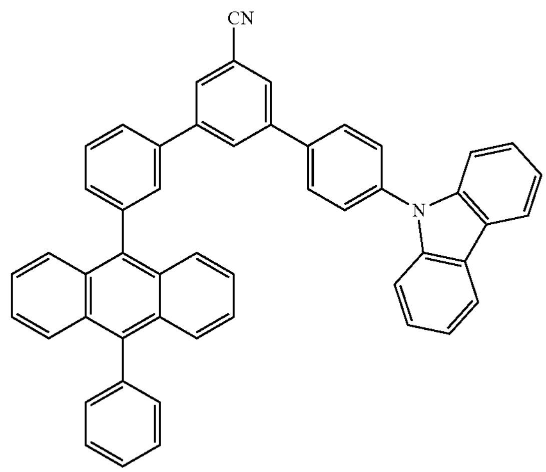
403
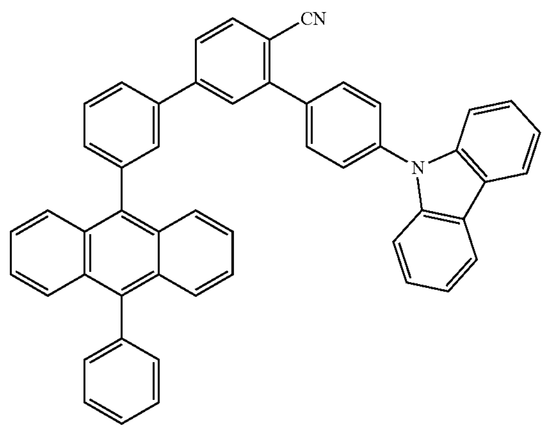
404
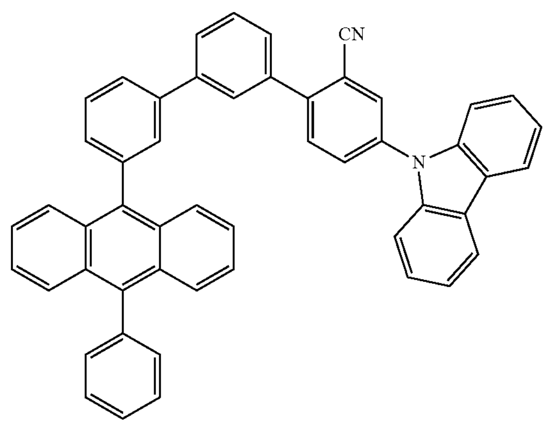
405
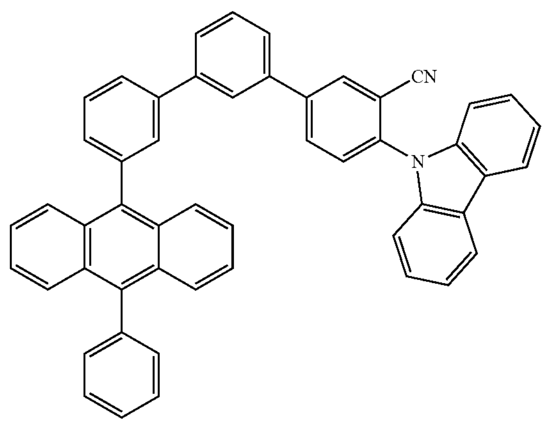
406
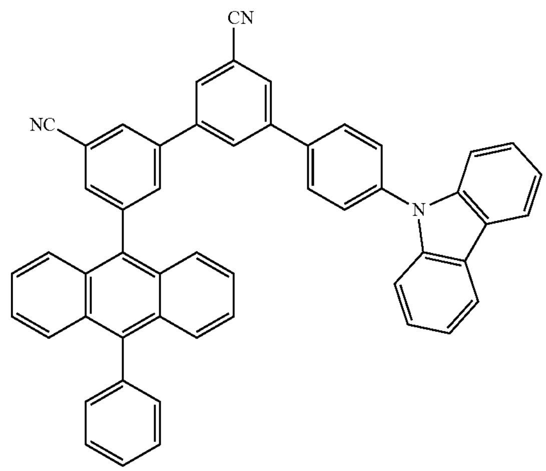

-continued
407
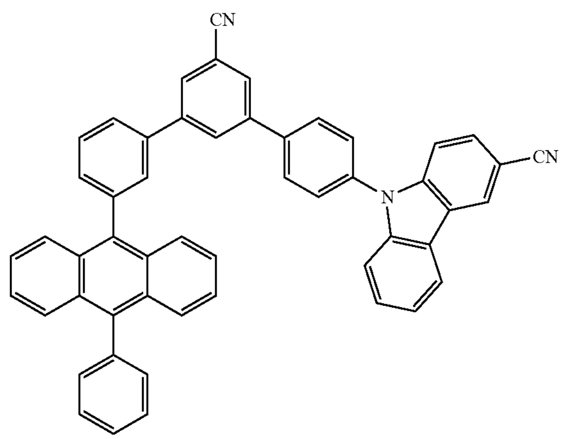
408
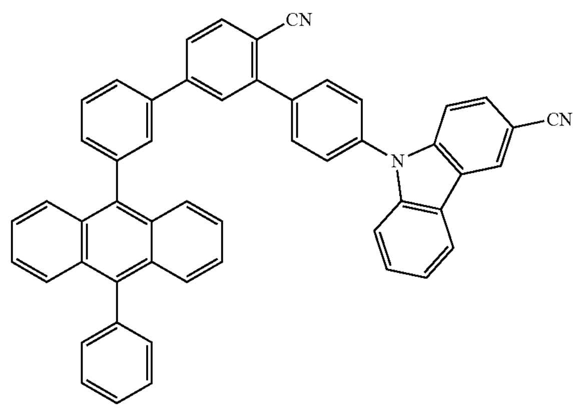
409
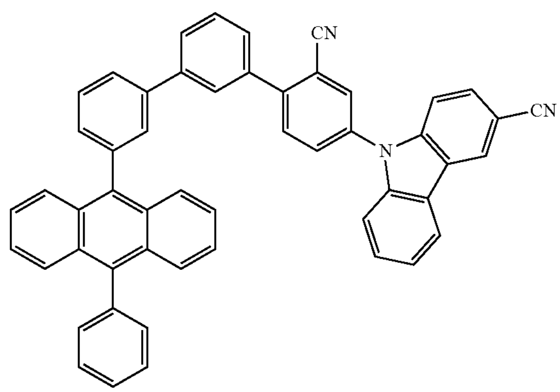
410
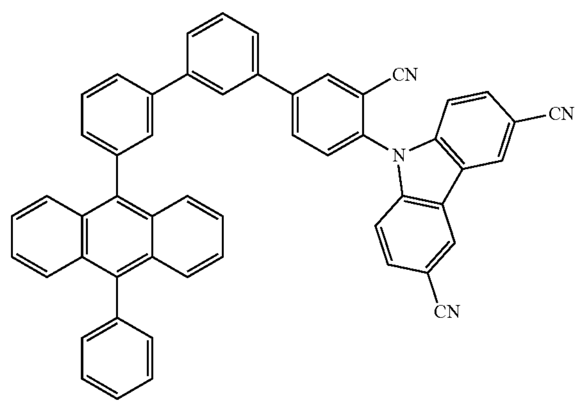
411
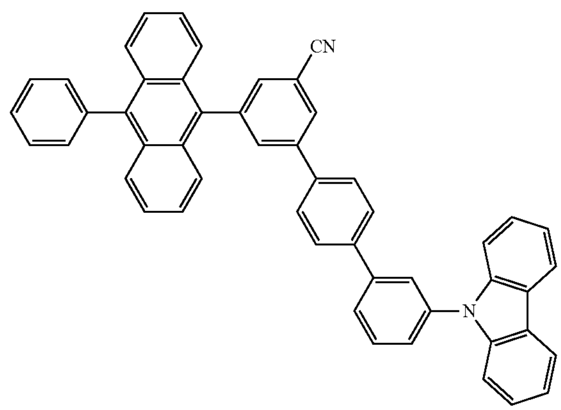
412
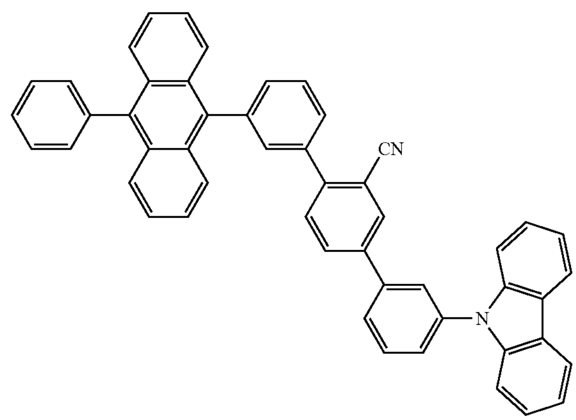

-continued
413
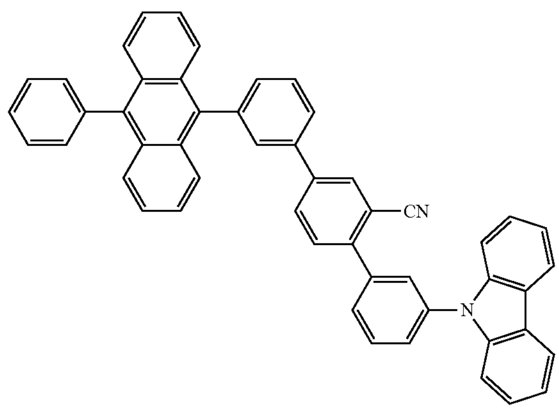
414
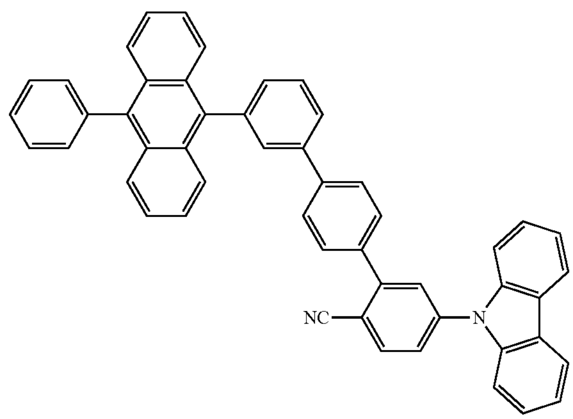
415
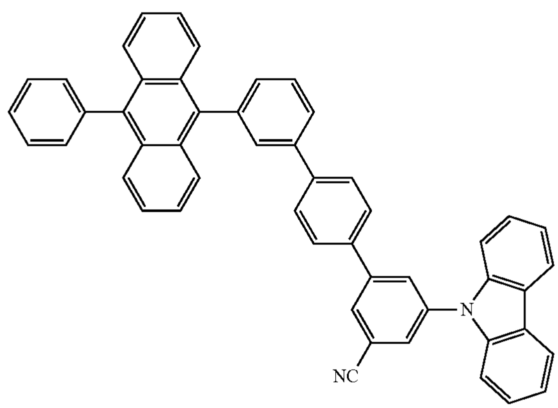
416
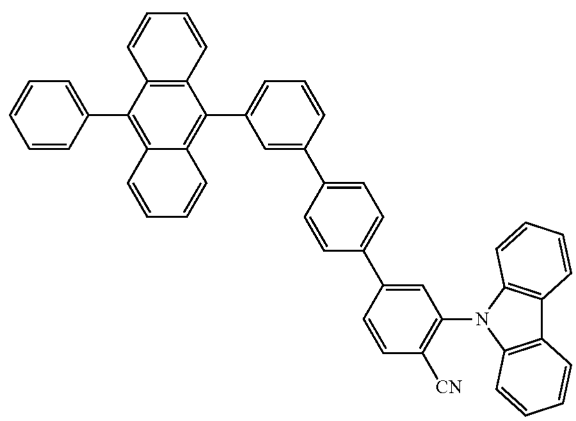
417
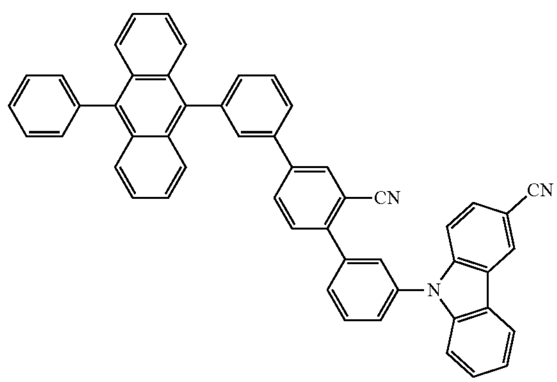
418
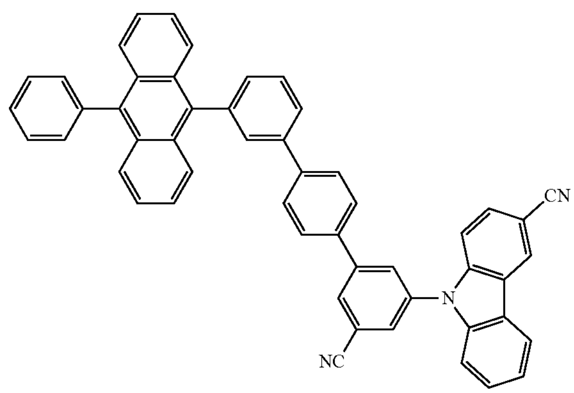

-continued
419
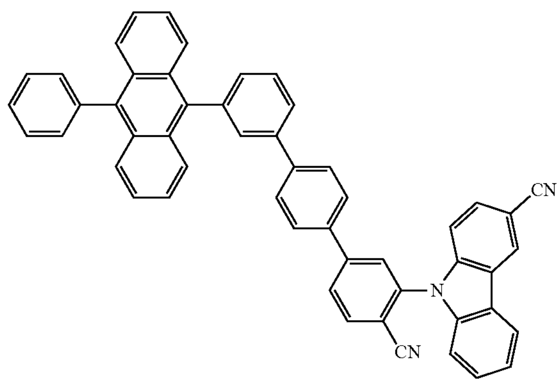
420
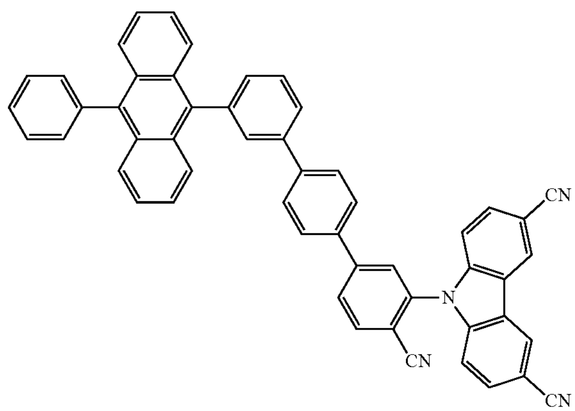
421
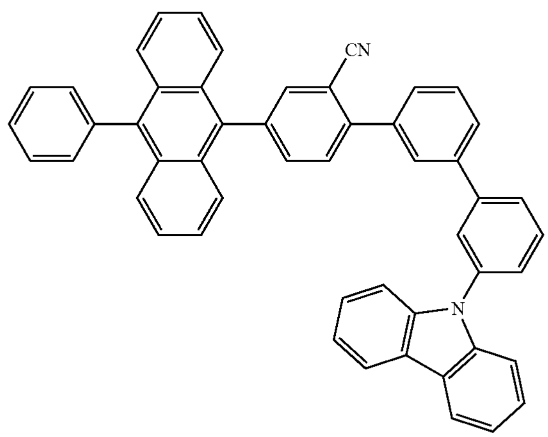
422
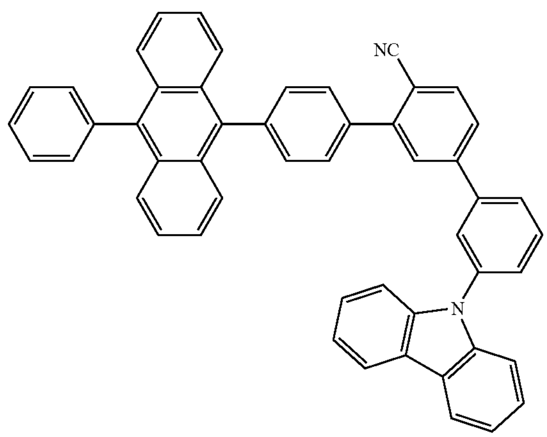
423
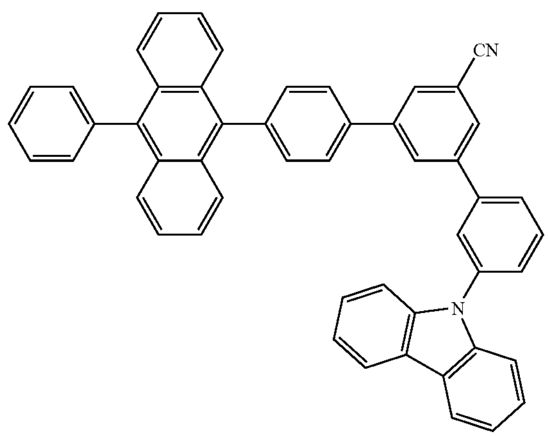
424
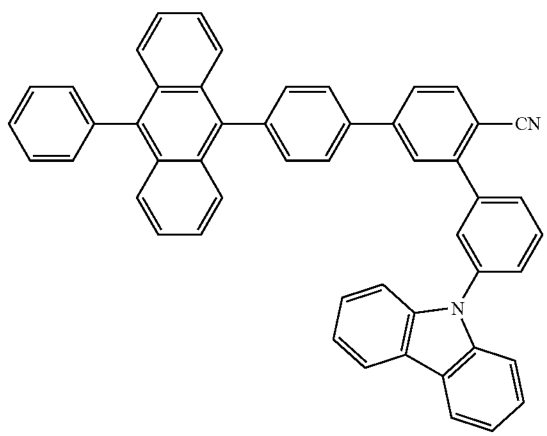

-continued
425
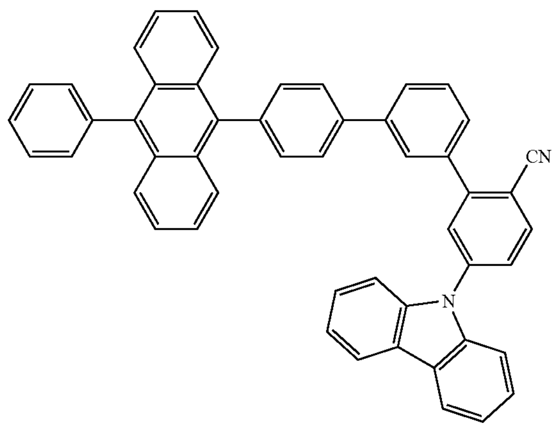
426
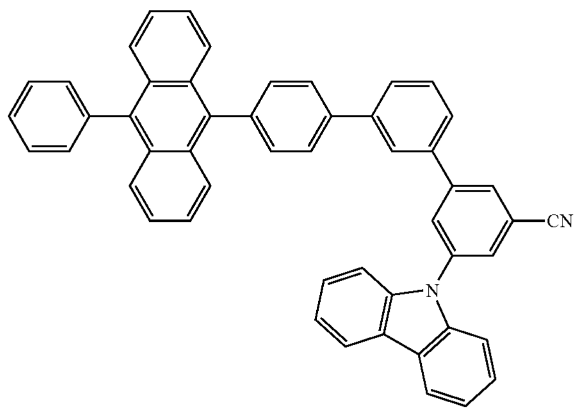
427
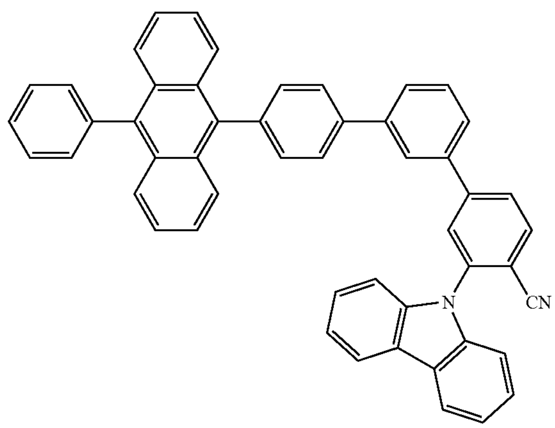
428
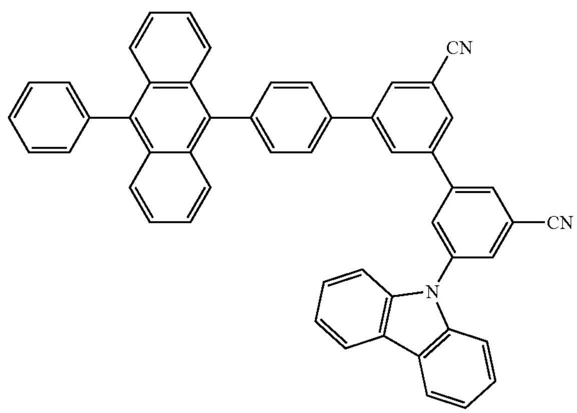
429
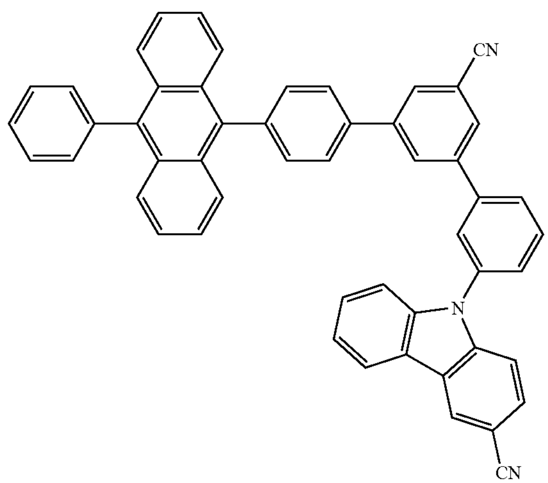
430
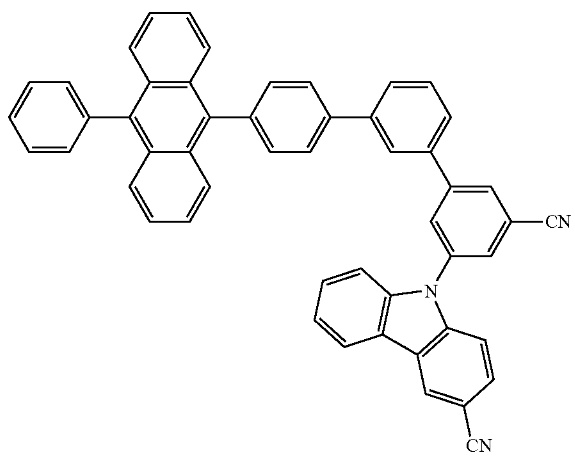

-continued
431
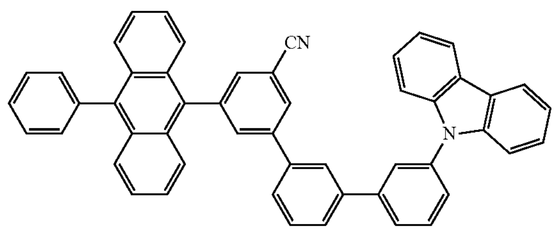
432
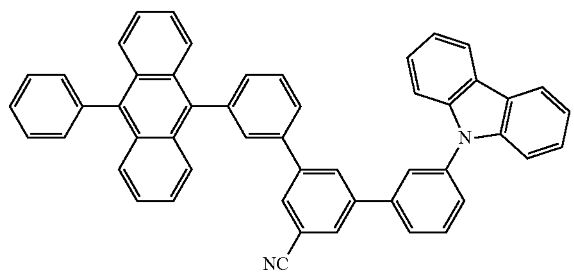
433
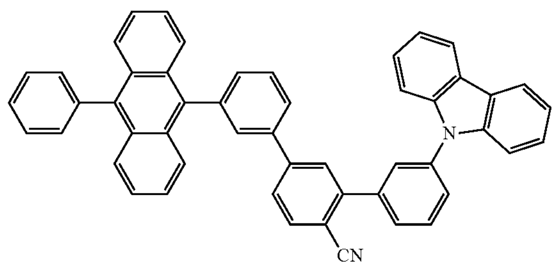
434
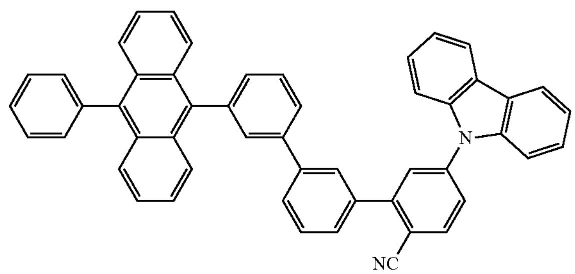
435
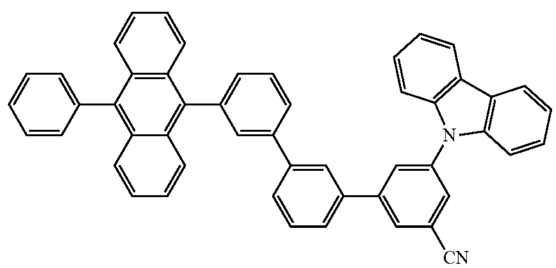
436
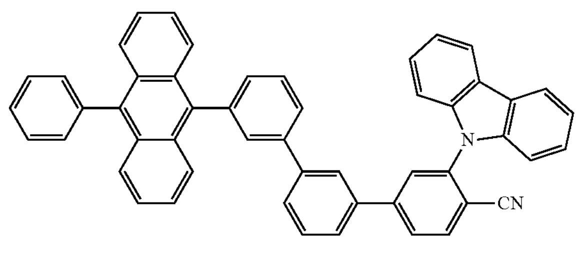
437
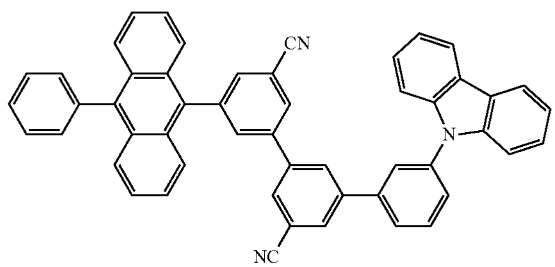
438
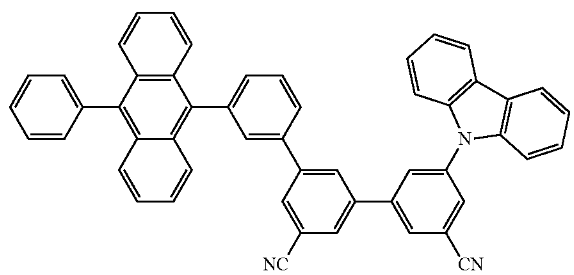
439
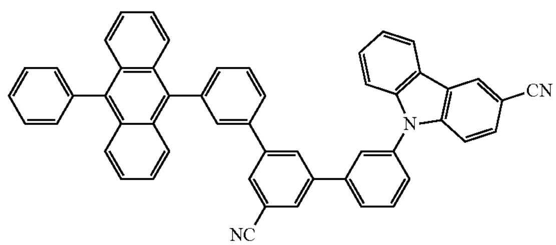
440
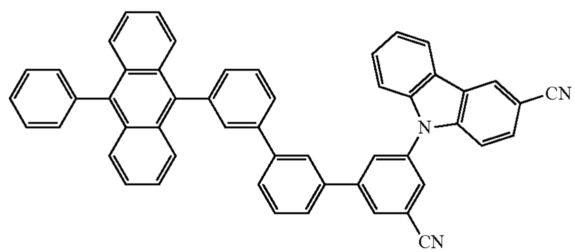

-continued
441
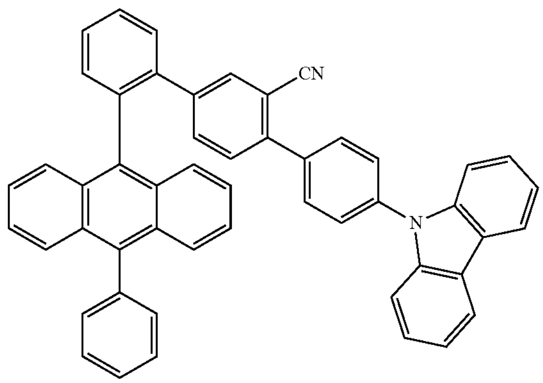
442
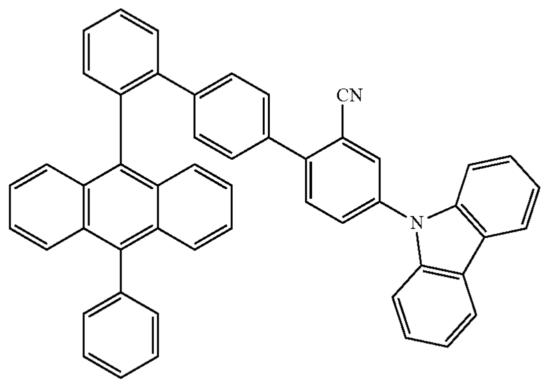
443
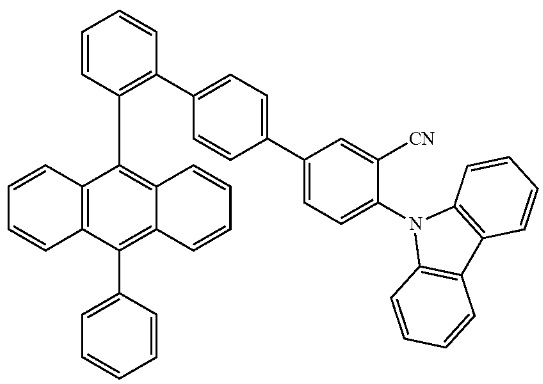
444
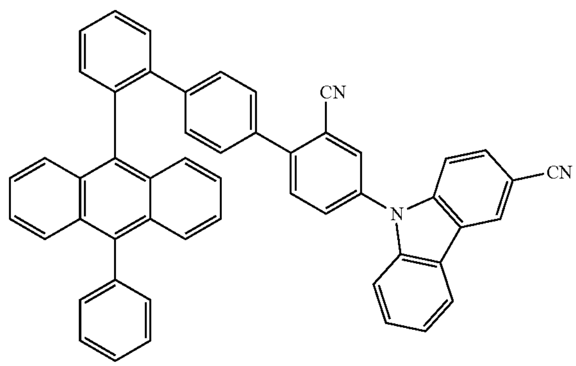
445
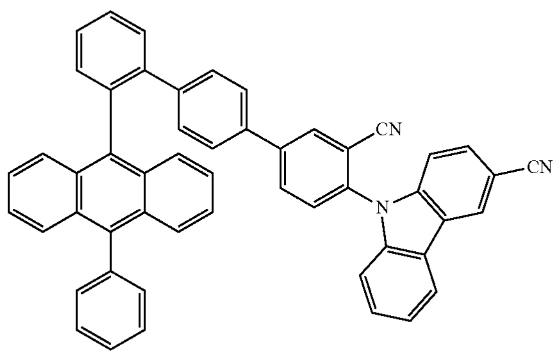
446
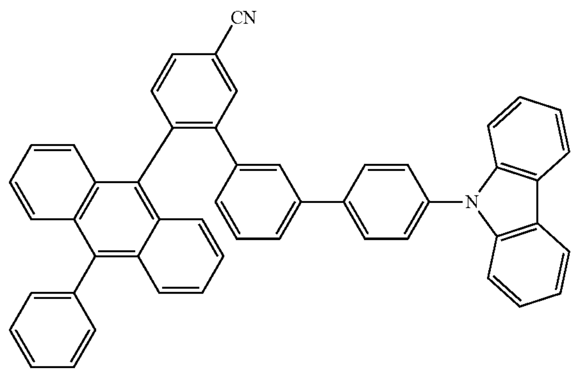
447
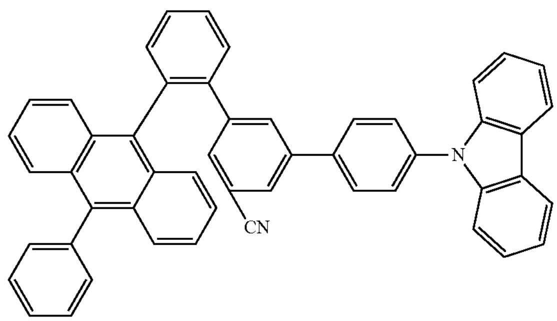
448
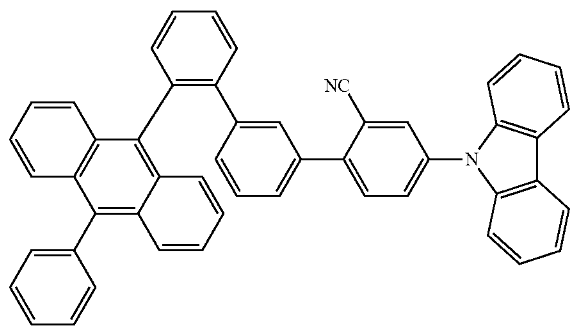

-continued
449
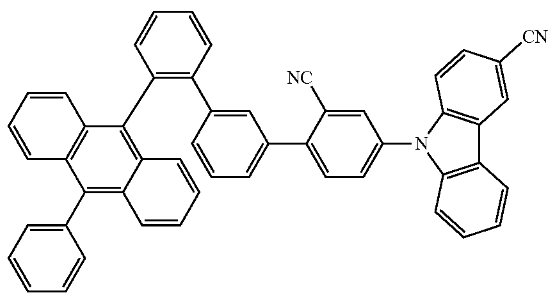
450
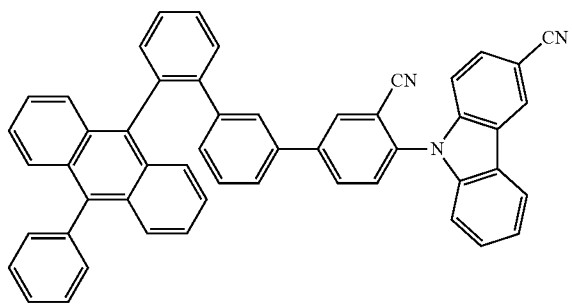
451
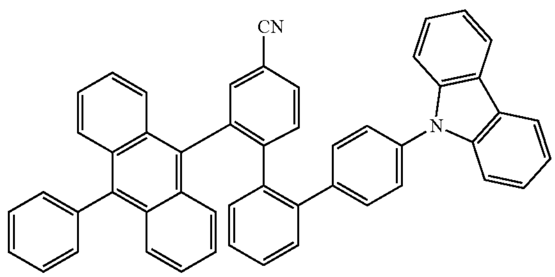
452
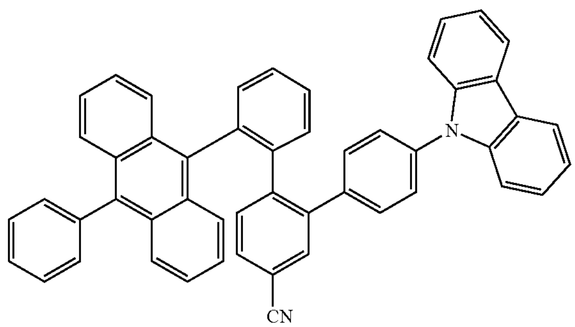
453
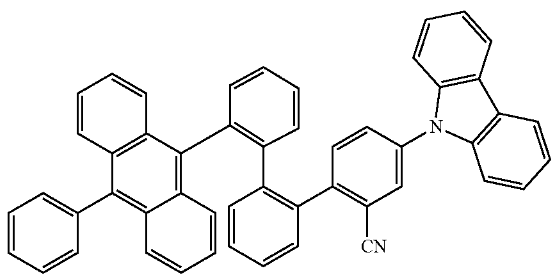
454
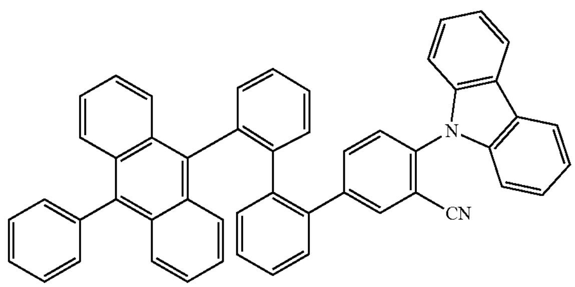
455
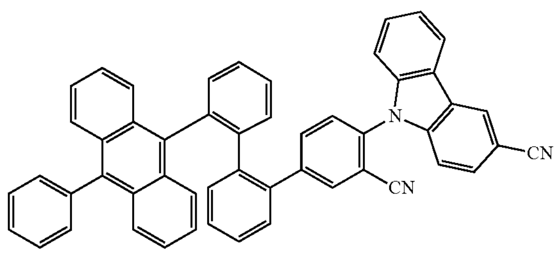
456
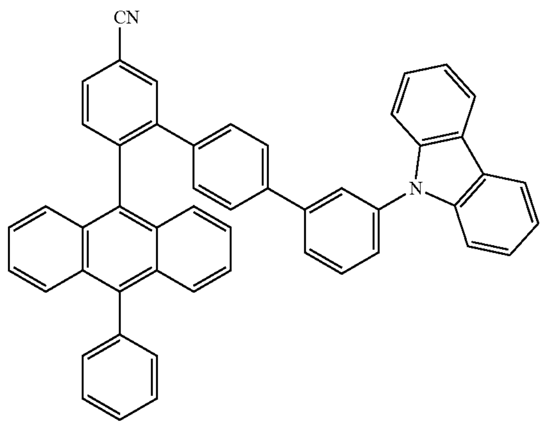

-continued
457
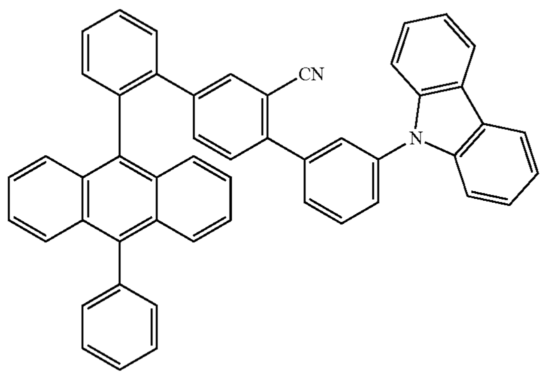
458
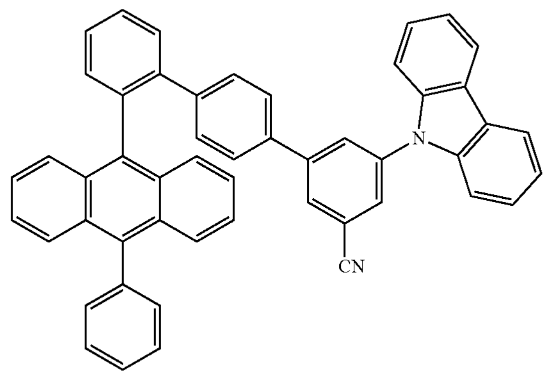
459
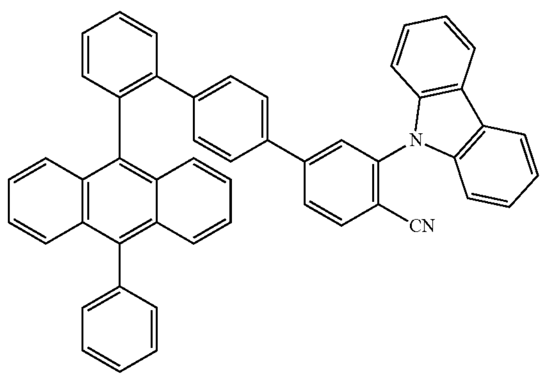
460
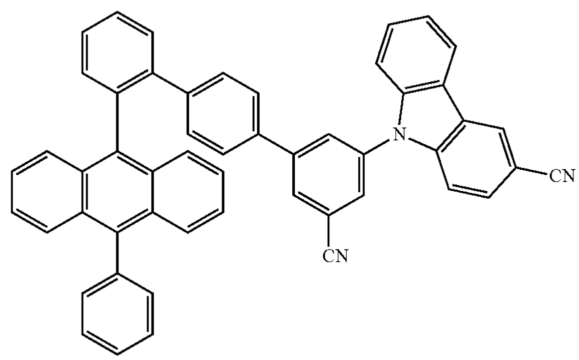
461
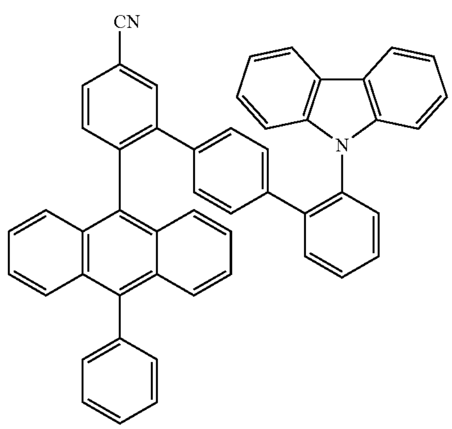
462
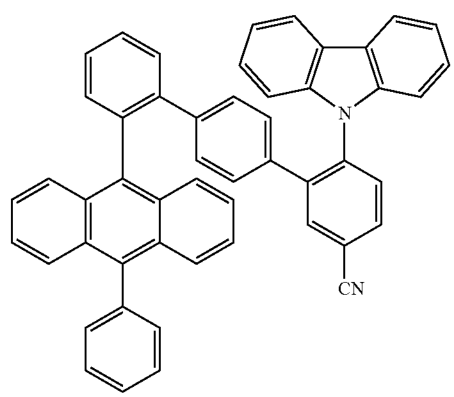
463
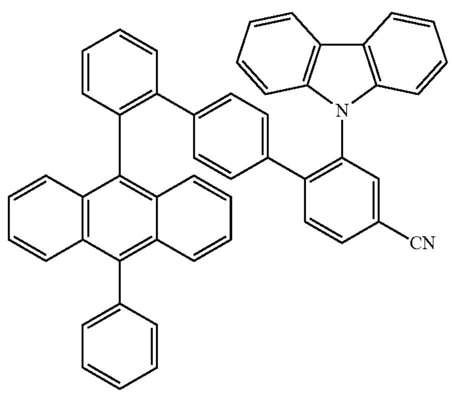
464
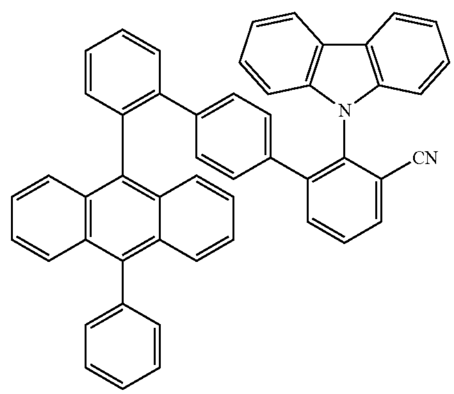

-continued
465
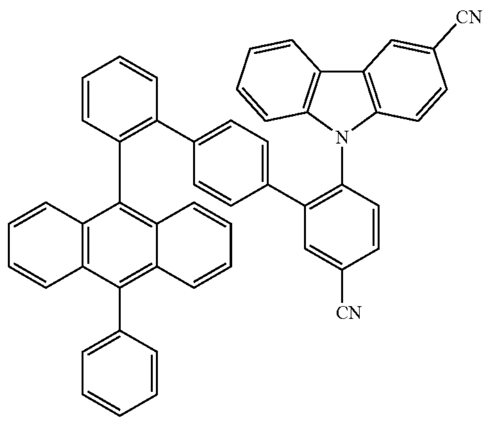
466
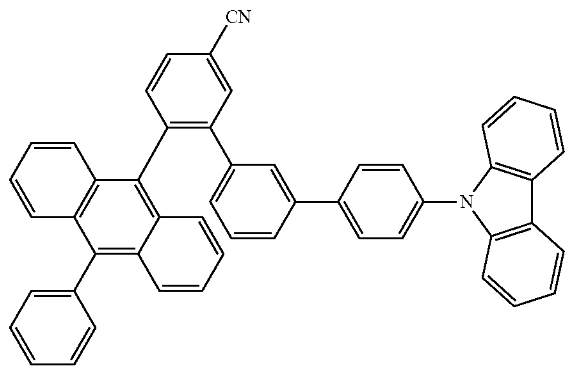
467
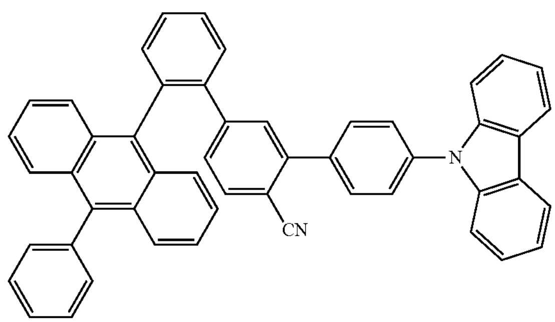
468
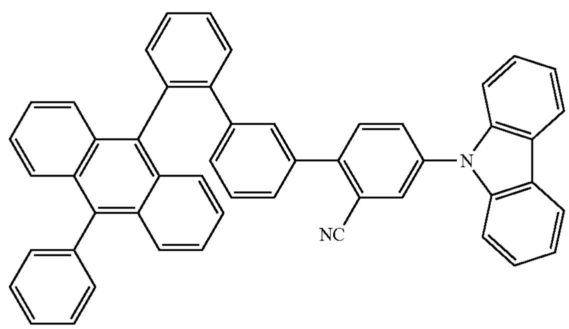
469
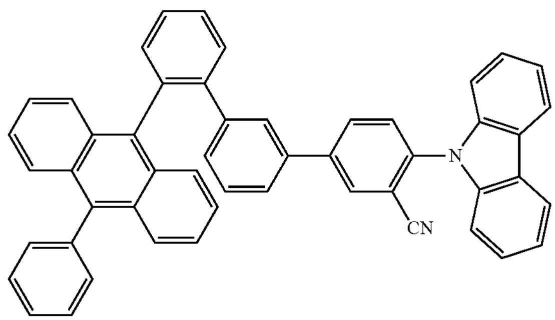
470
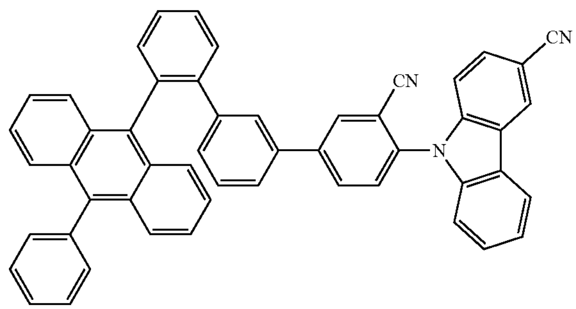
471
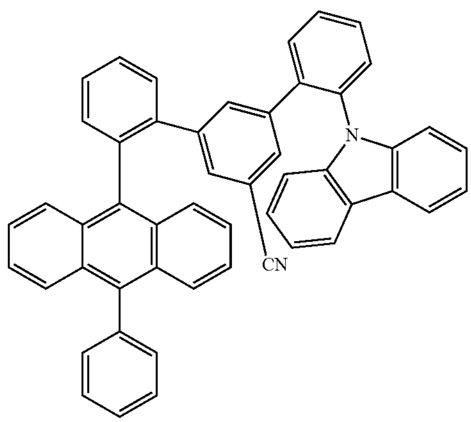
472
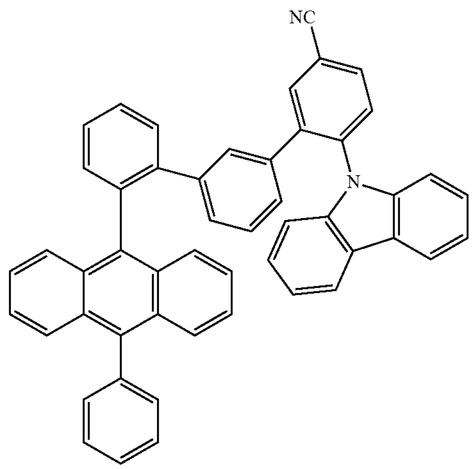

-continued
473
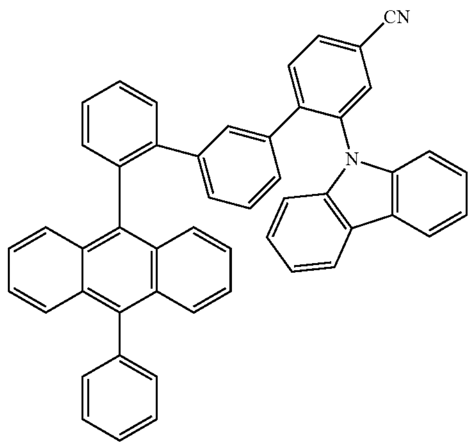
474
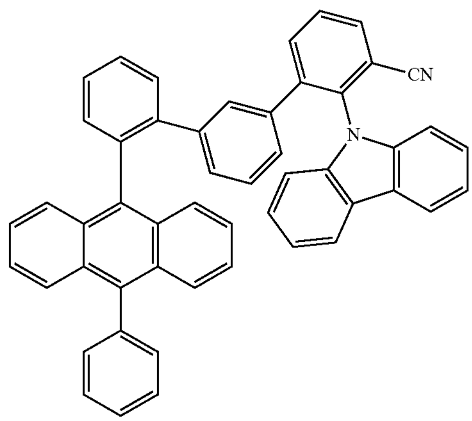
475
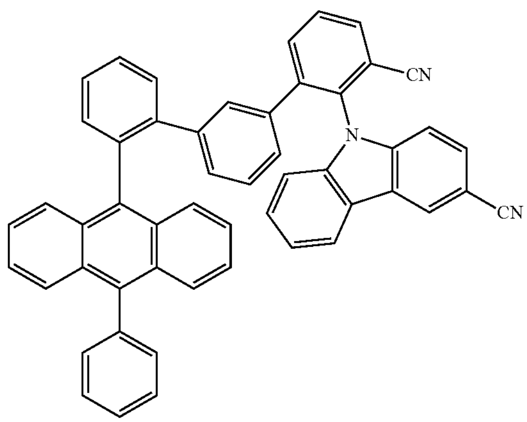
476
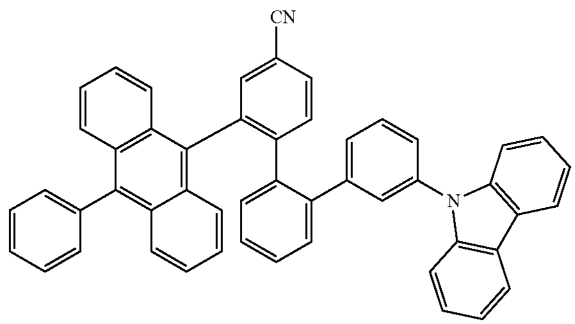
477
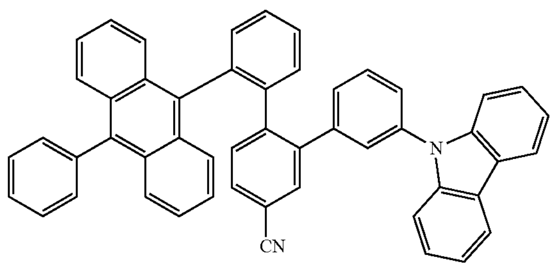
478
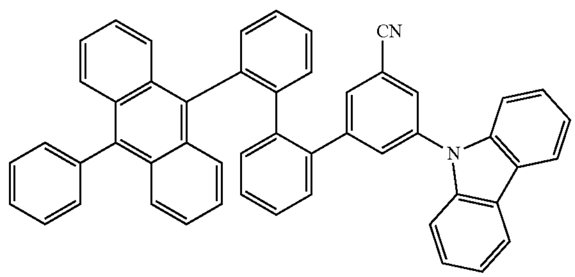
479
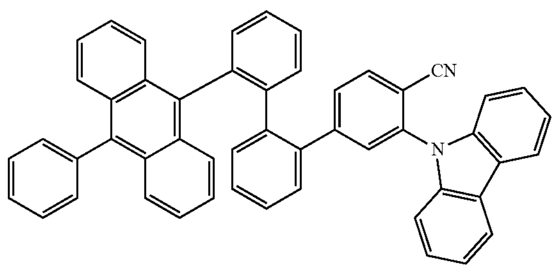
480
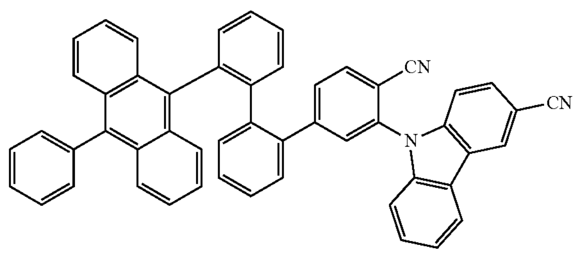

-continued
481
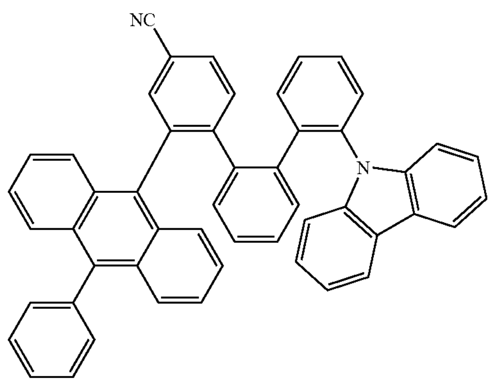
482
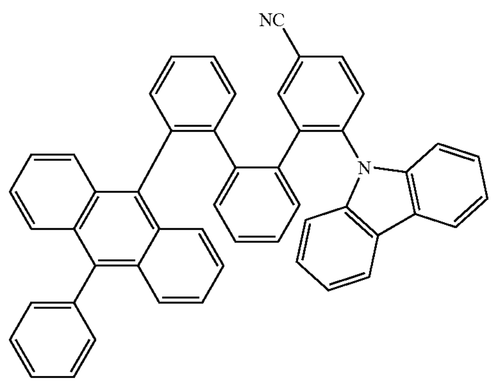
483
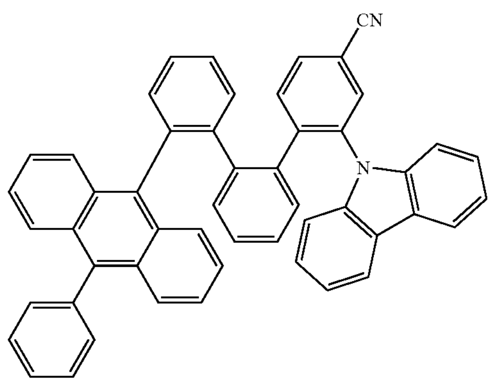
484
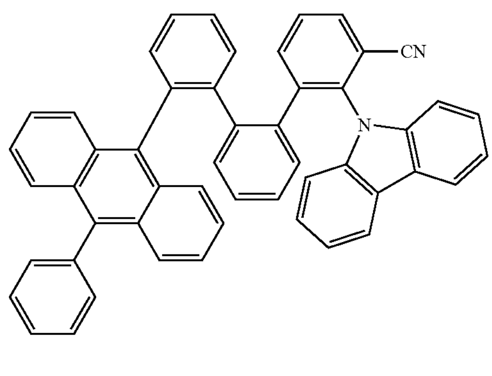
485
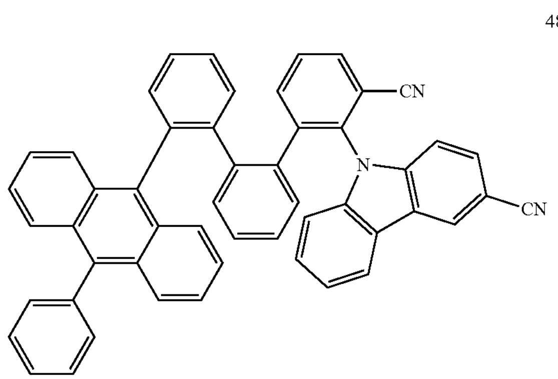
486
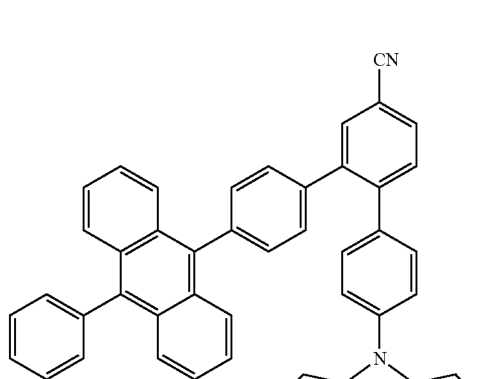
487
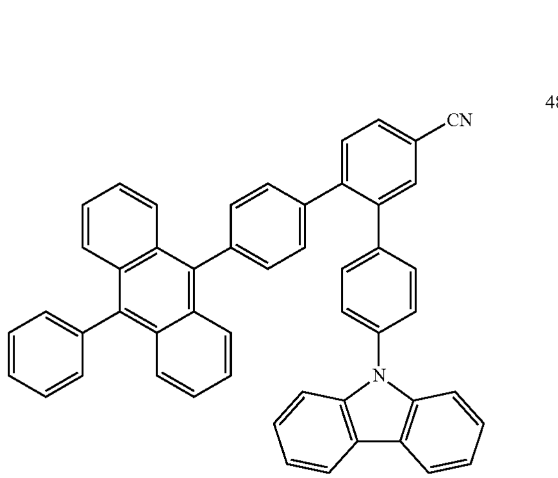
488
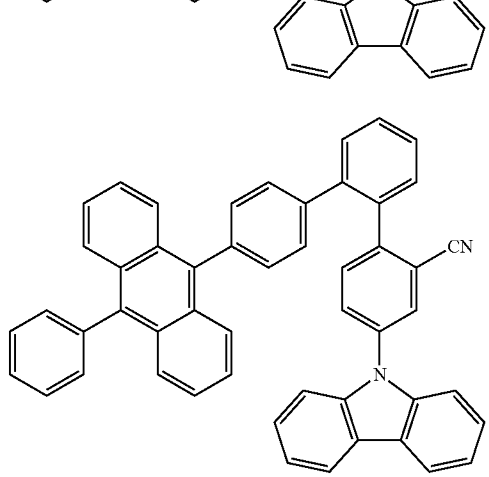

-continued
489
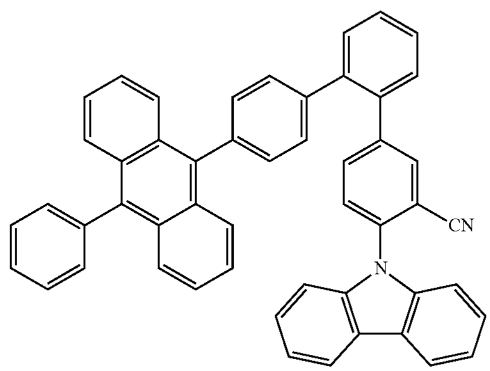
490
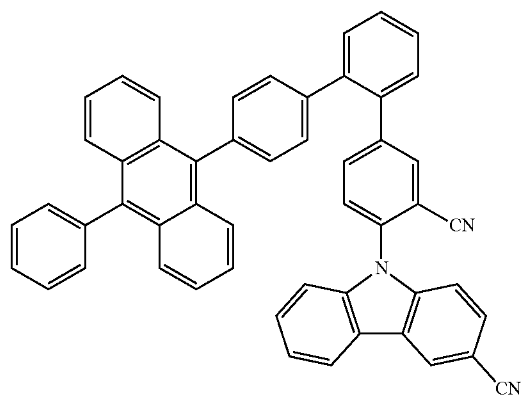
491
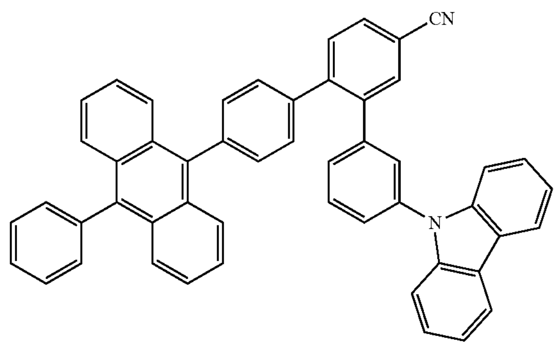
492
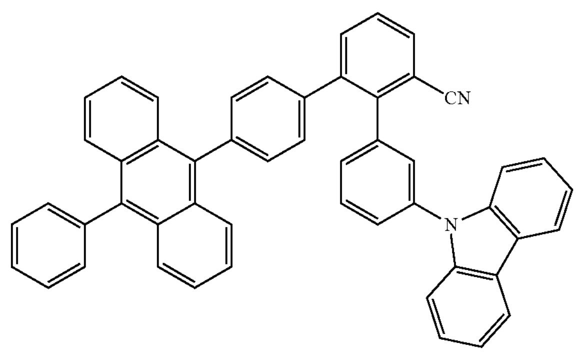
493
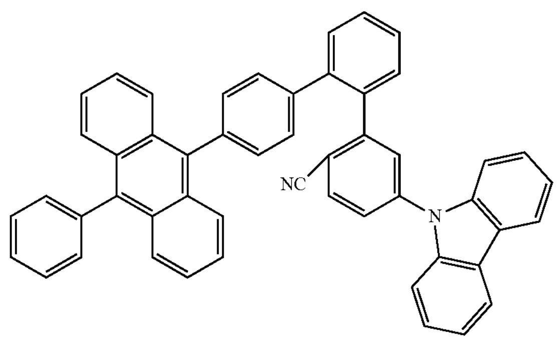
494
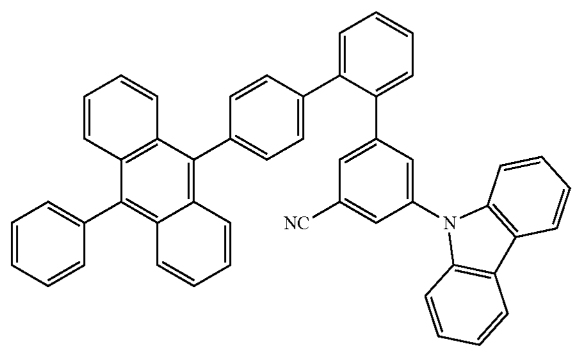
495
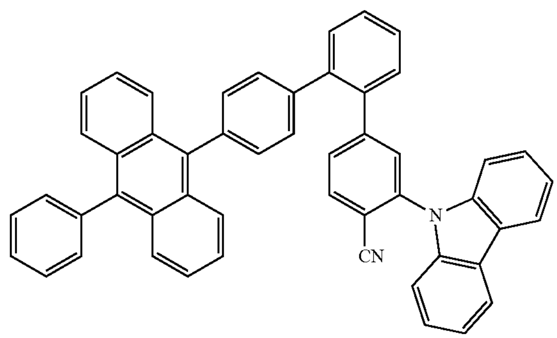
496
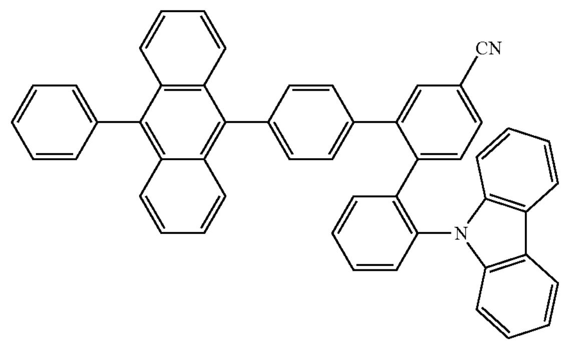

-continued
497
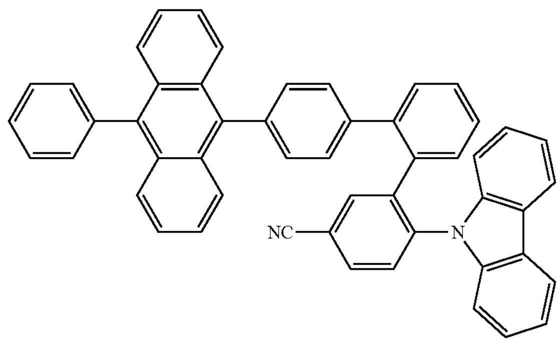
498
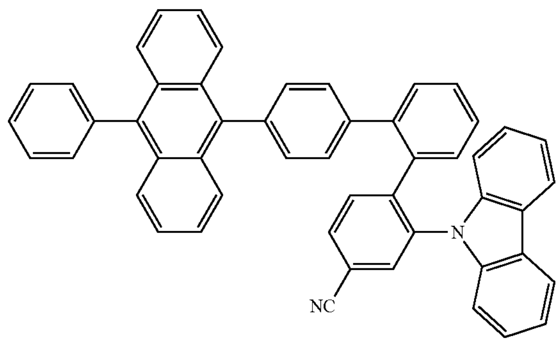
499
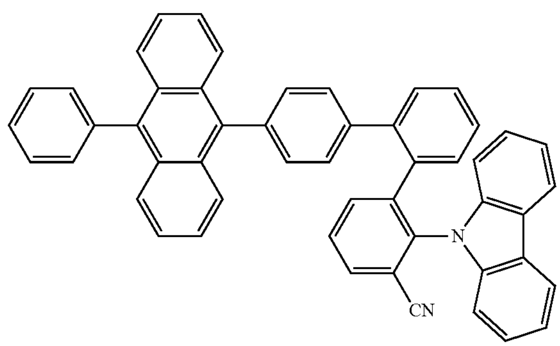
500
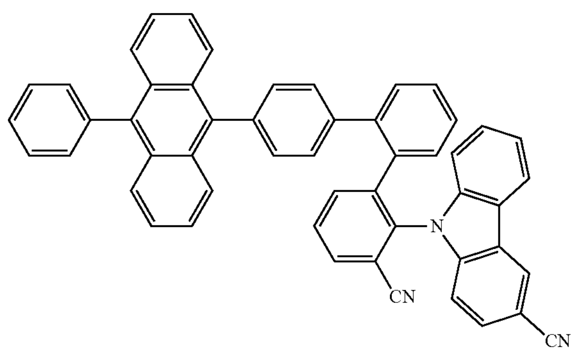
501
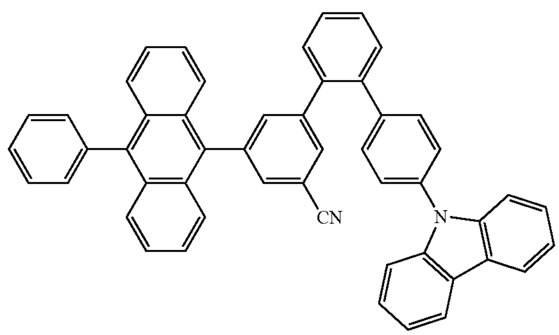
502
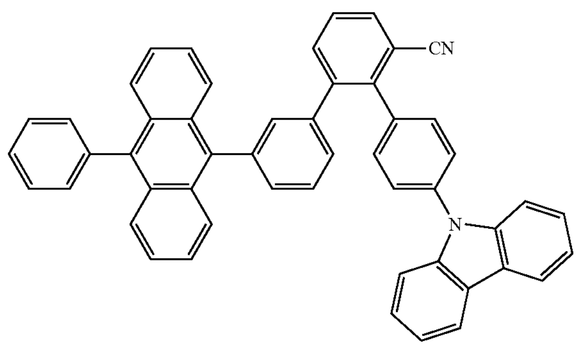
503
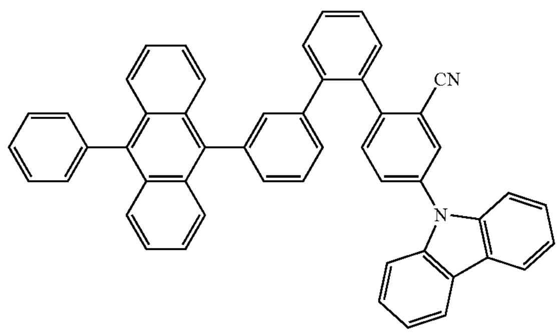
504
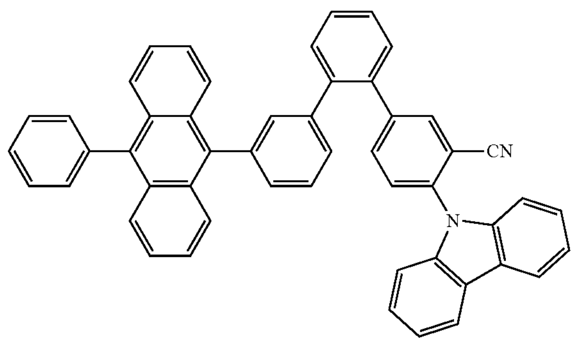

-continued
505
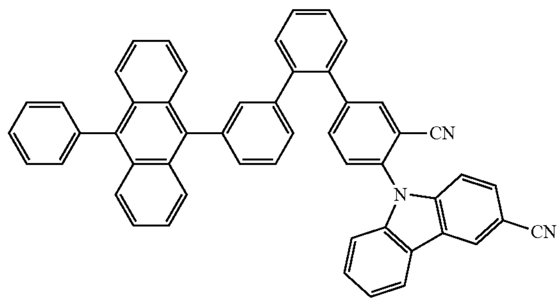
506
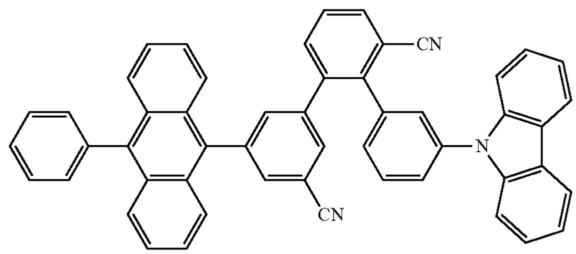
507
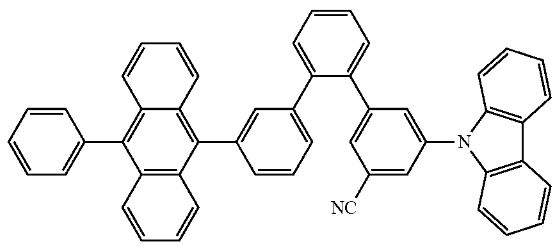
508
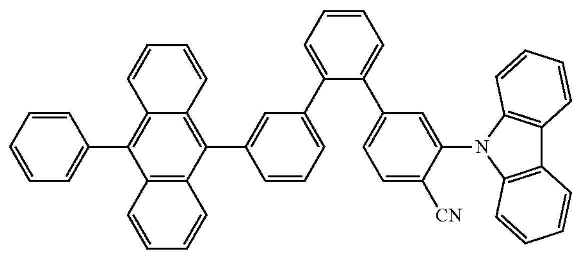
509
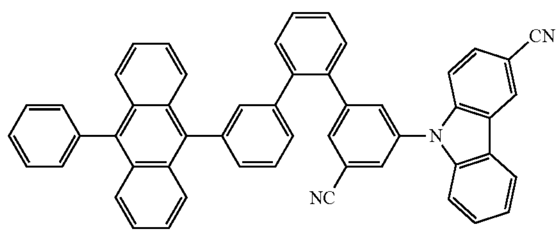
510
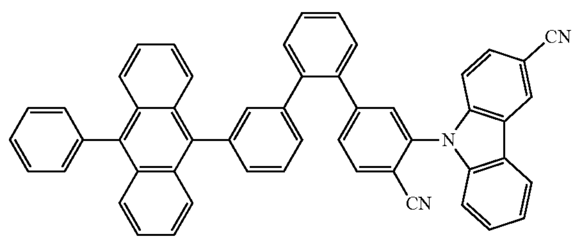
511
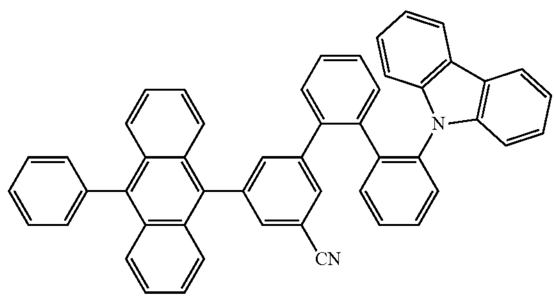
512
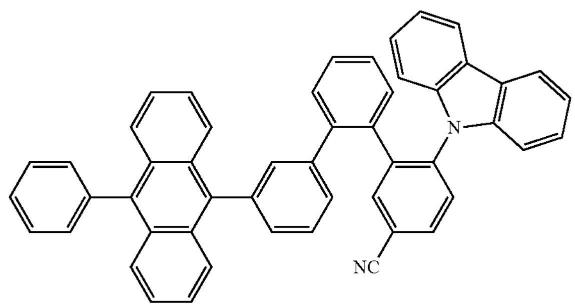
513
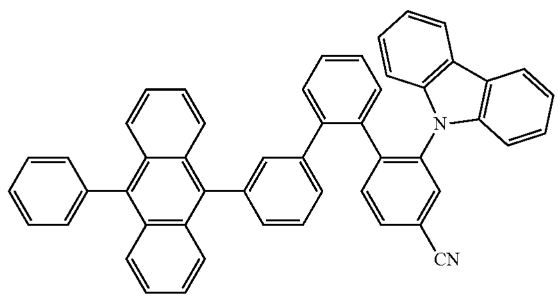
514
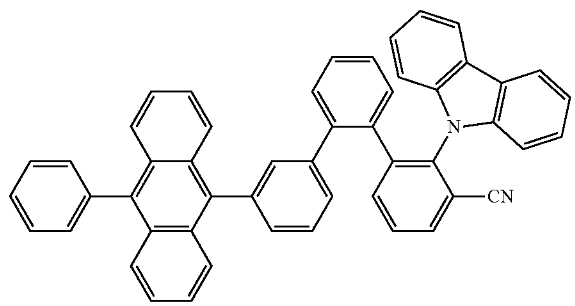

-continued
515
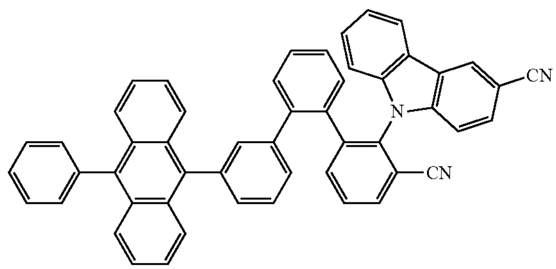
516
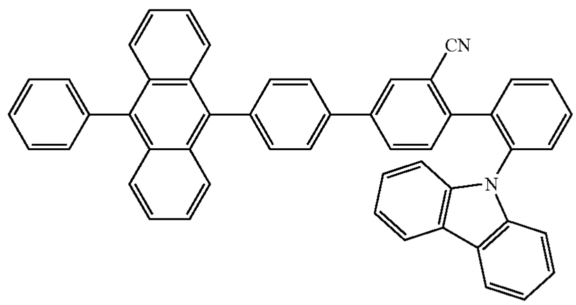
517
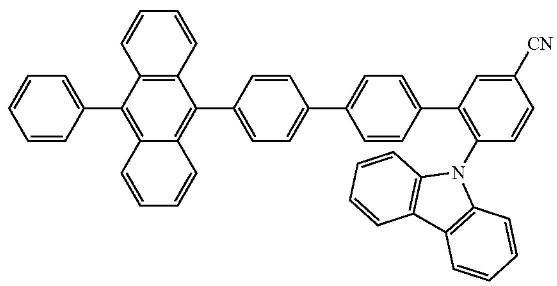
518
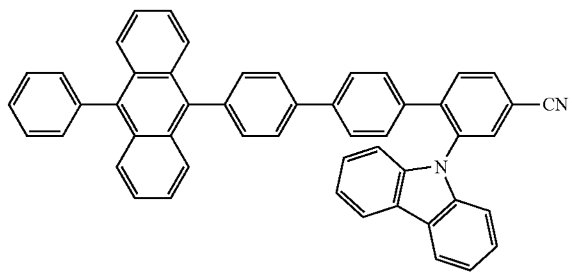
519
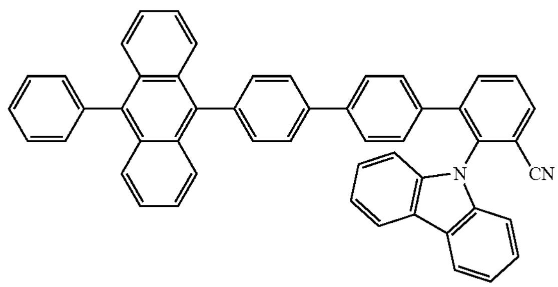
520
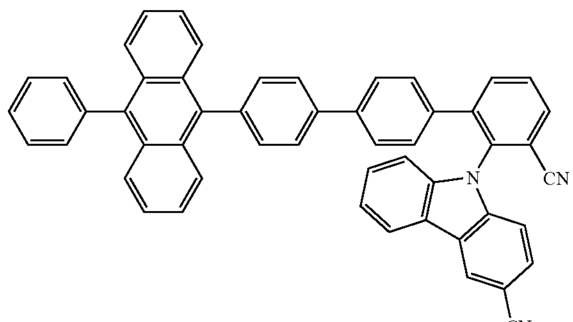
521
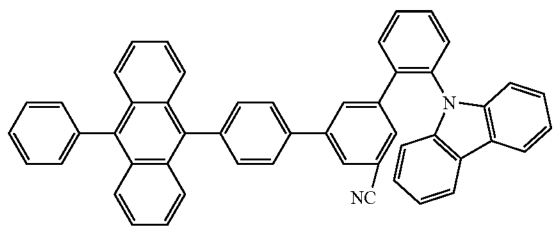
522
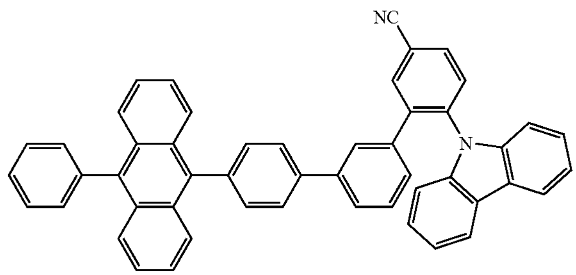
523
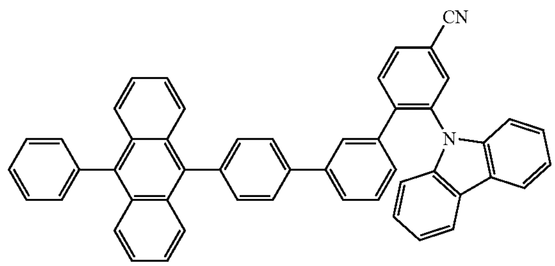
524
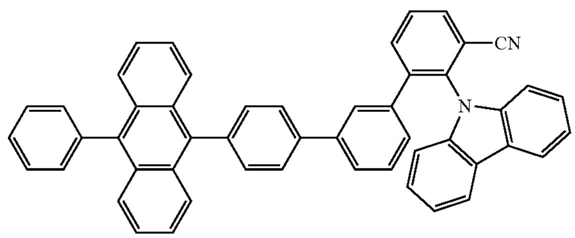

-continued
525
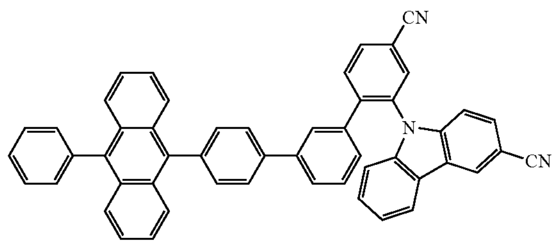
526
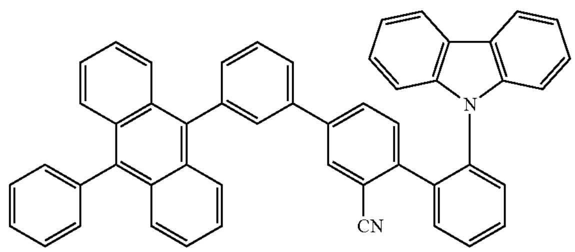
527
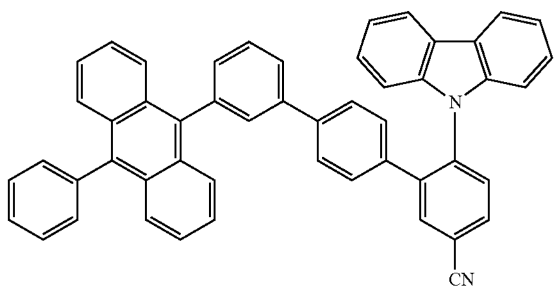
528
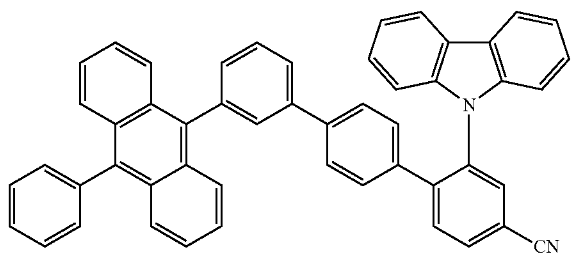
529
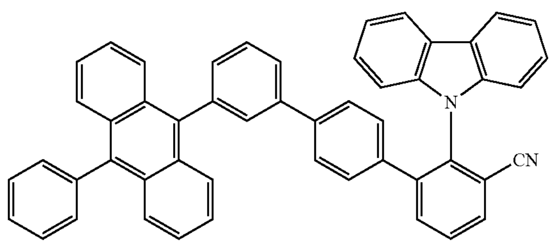
530
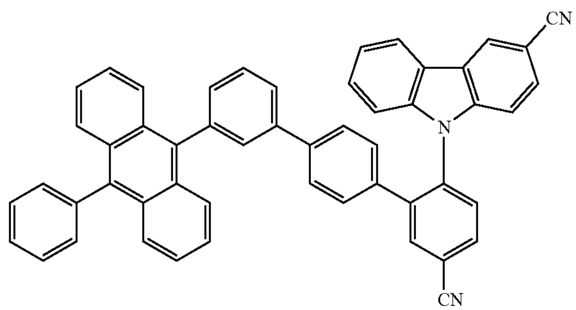
531
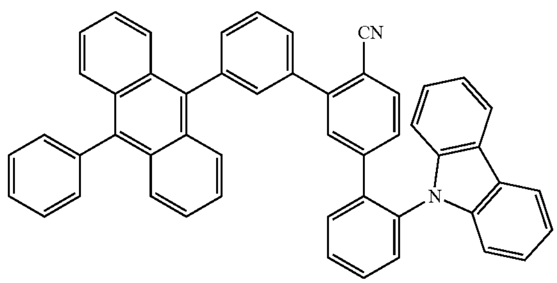
532
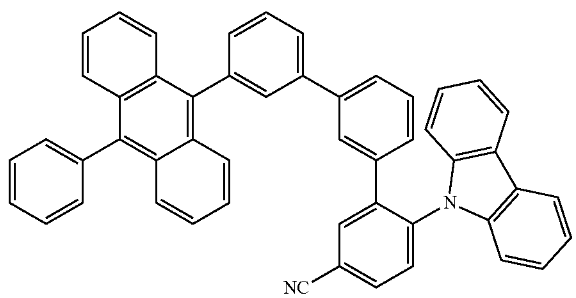
533
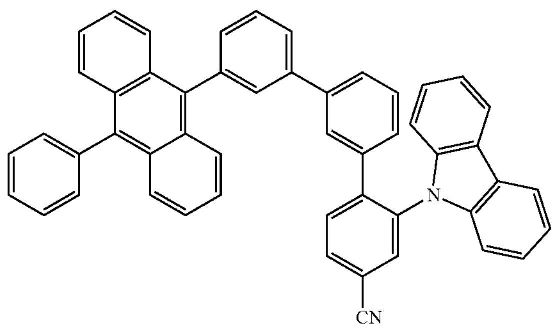
534
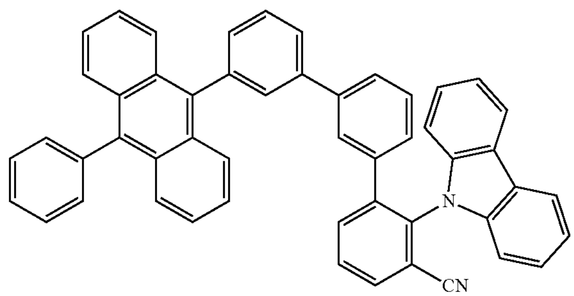

-continued
535
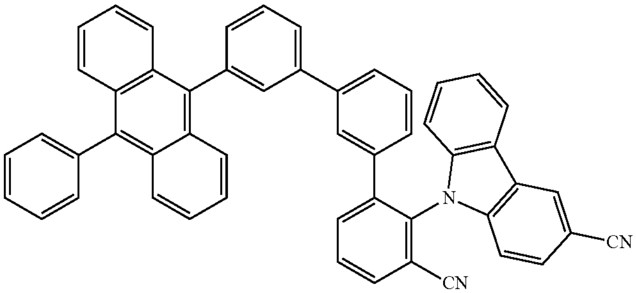
536
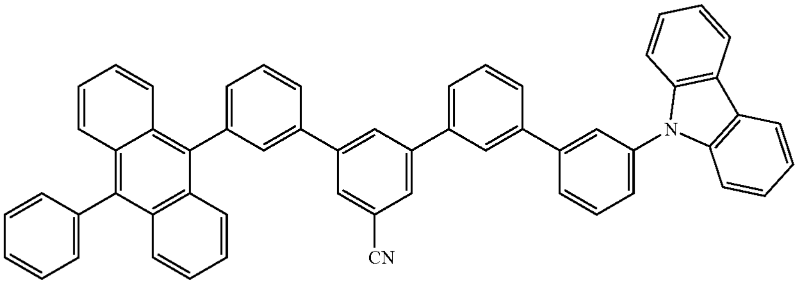
537
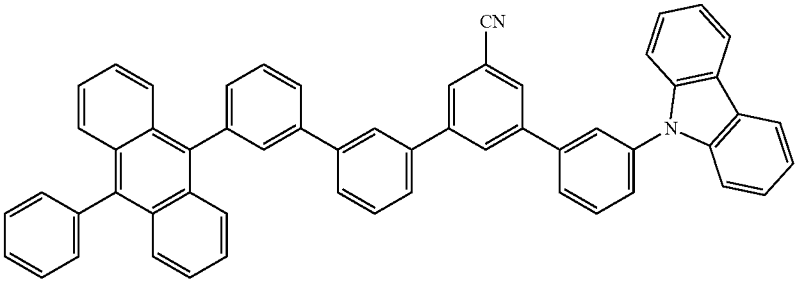
538
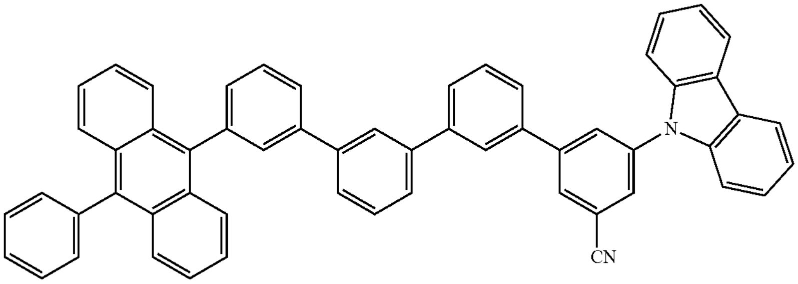
539
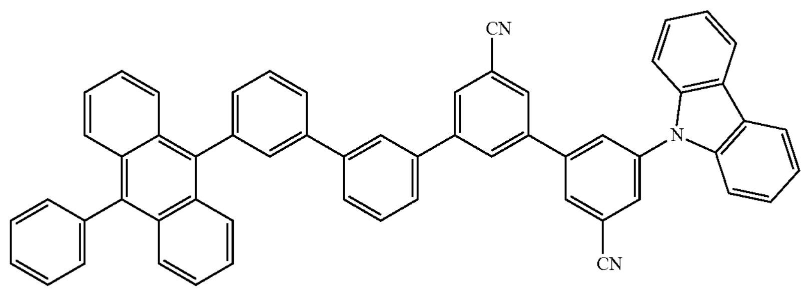

-continued
540
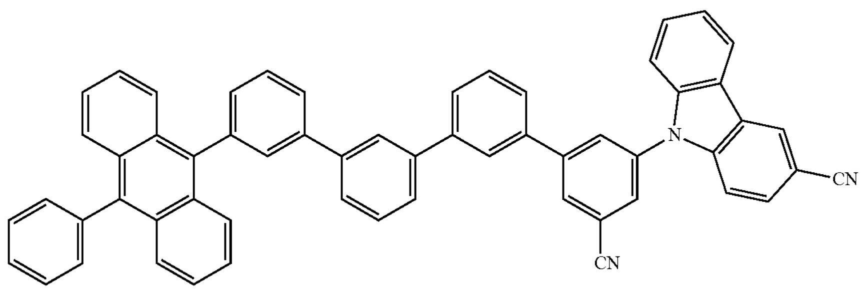
541
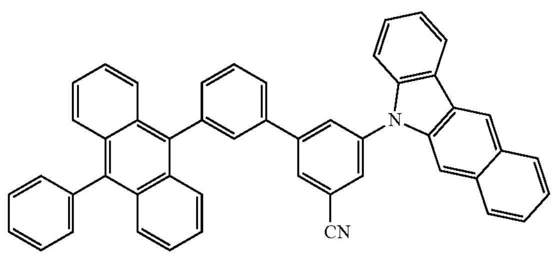
542
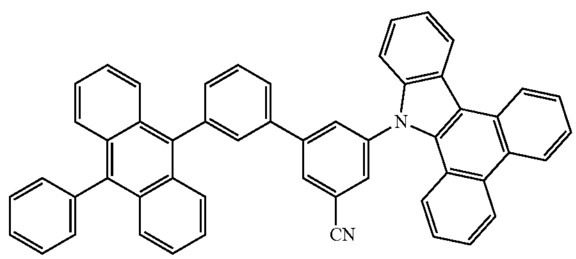
543
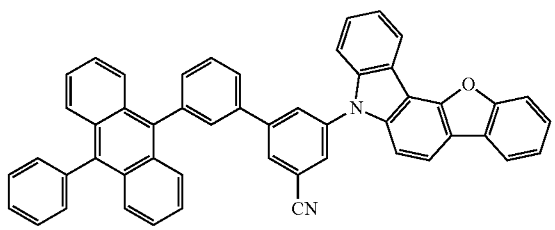
544
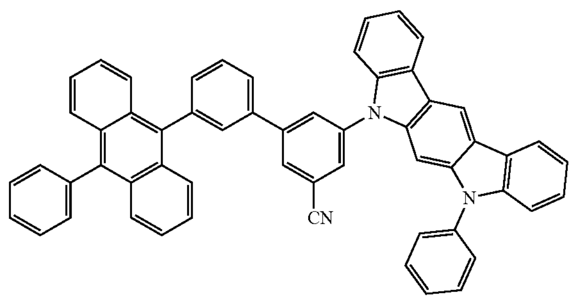
545
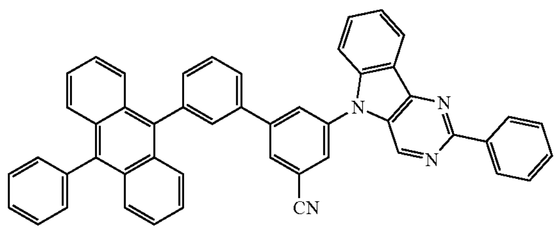
546
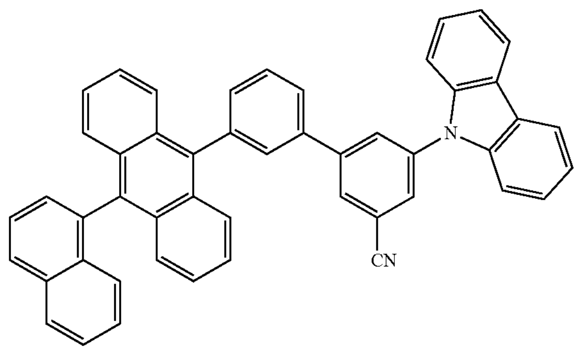
547
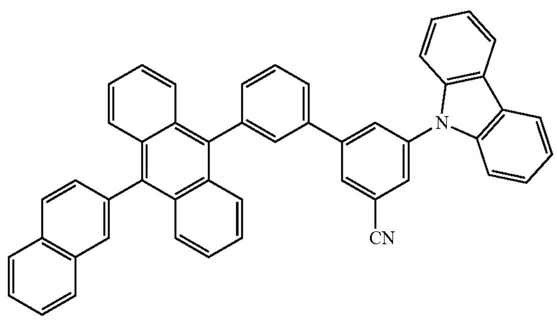
548
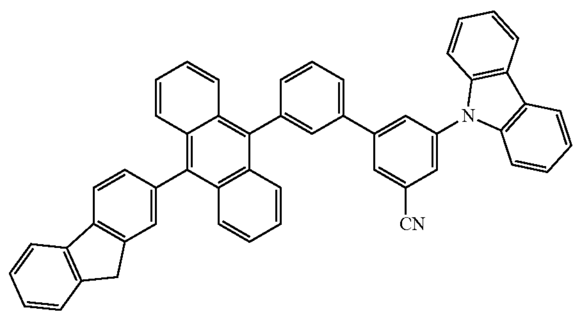

-continued
549
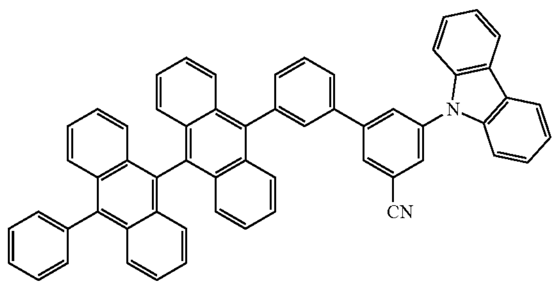
550
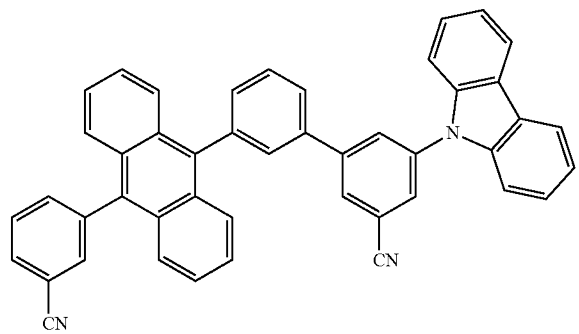
551
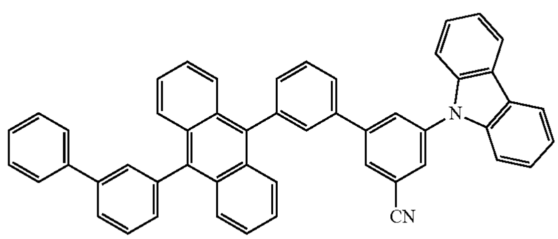
552
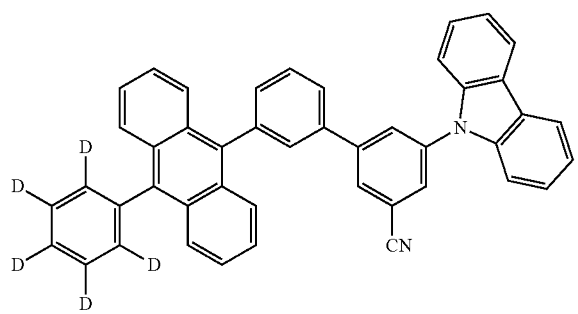
553
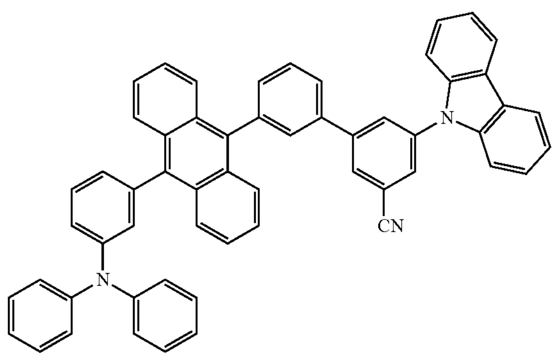
554
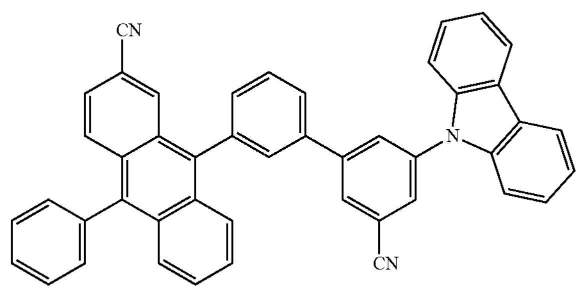
555
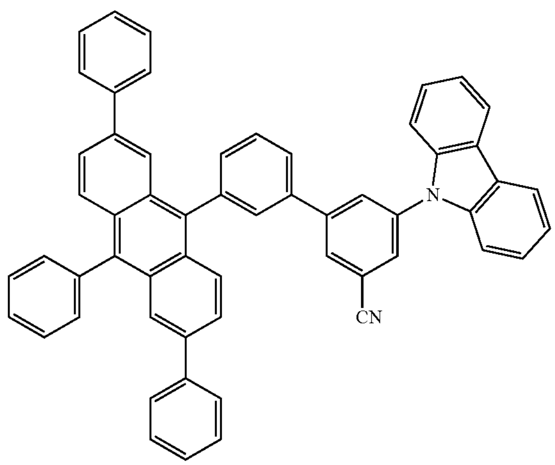
556
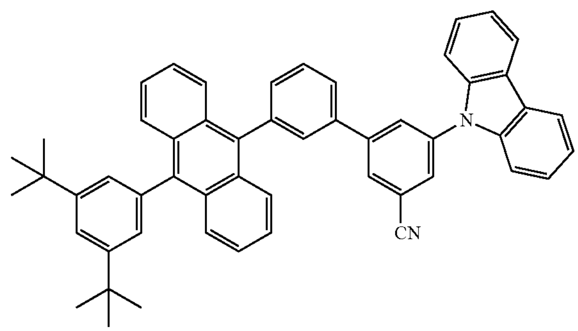

-continued

557

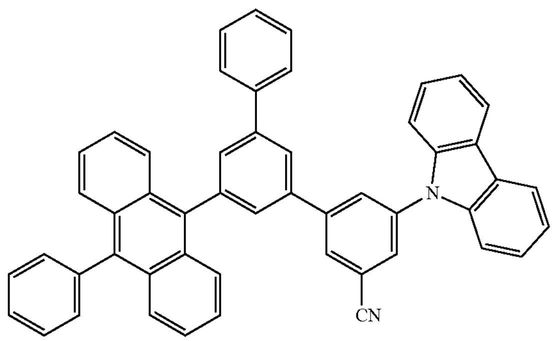

558

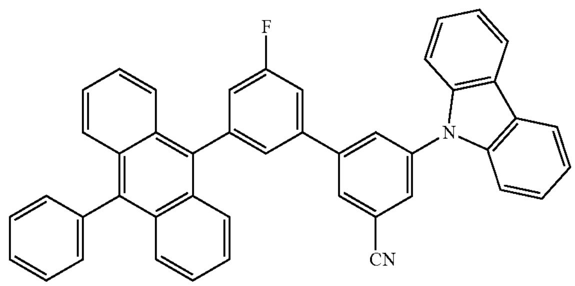

559

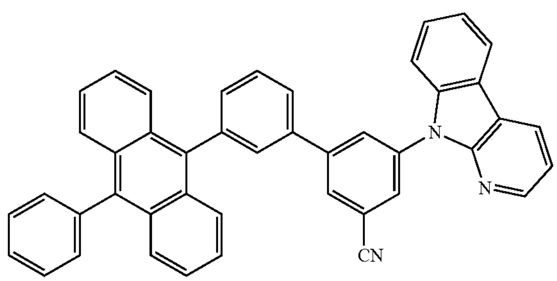

560

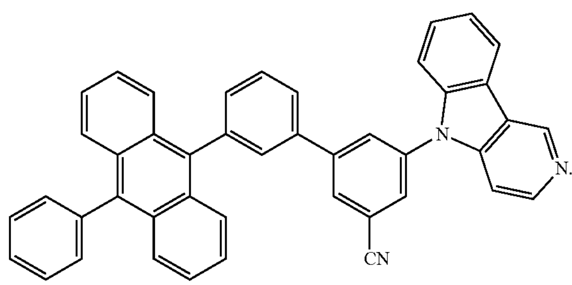

In one or more embodiments, the fluorescent host may be represented by Formula FH-4:

Formula FH-4

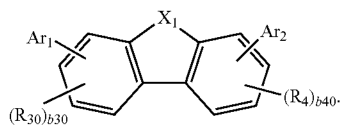

In Formula FH-4, $X_1$ may be O or Se, $Ar_1$ may be a group represented by Formula 1A, and $Ar_2$ may be a group represented by Formula 1B:

Formula 1A

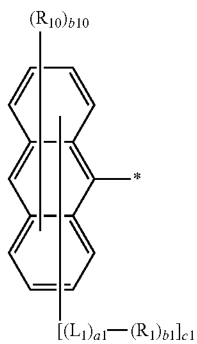

-continued

Formula 1B

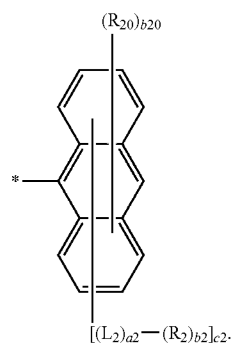

In Formulae 1A and 1B, $L_1$ and $L_2$ may each independently be a substituted or unsubstituted $C_5$-$C_{30}$ carbocyclic group or a substituted or unsubstituted $C_1$-$C_{30}$ heterocyclic group, a1 and a2 may each independently be an integer from 0 to 3, when a1 is 2 or more, two or more of Li may be identical to or different from each other, and when a2 is 2 or more, two or more of $L_2$ may be identical to or different from each other, $R_1$, $R_2$, $R_{10}$, $R_{20}$, $R_{30}$, and $R_{40}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{60}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, b1 and b2 may each independently be an integer from 1 to 5, when b1 is 2 or more, two or more of $R_1$ may be identical to or different from each other, and when b2 is 2 or more, two or more of $R_2$ may be identical to or different from each other, b10 and b20 may each independently an integer from 1 to 8, b30 and b40 may each independently an integer from 1 to 3, c1 and c2 may each independently be an integer from 1 to 8, and the sum of b10 and c1 may be 9, and the sum of b20 and c2 may be 9.

In detail, the fluorescent host represented by Formula FH-4 may be a compound of Group FH4, embodiments of the present disclosure are not limited thereto:

Group FH4

1

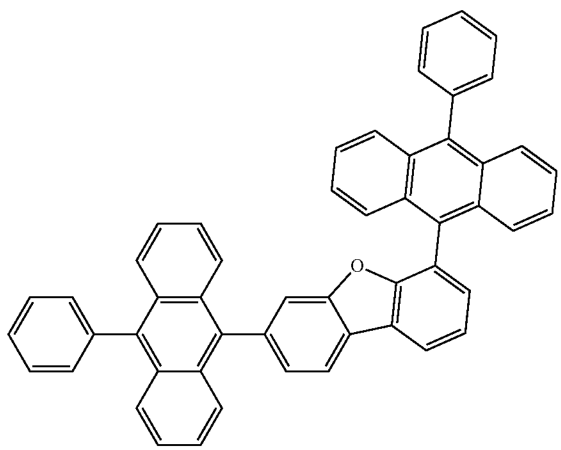

-continued

2

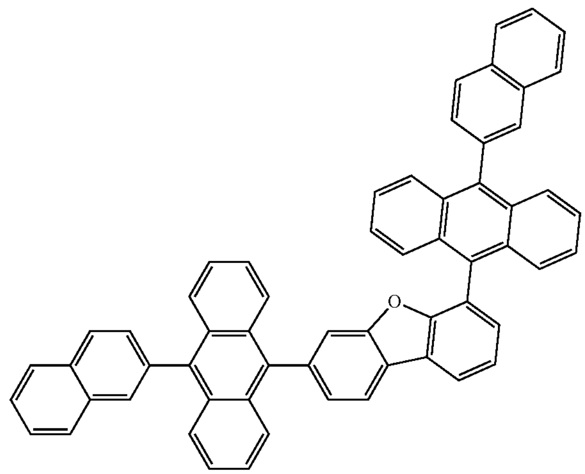

3

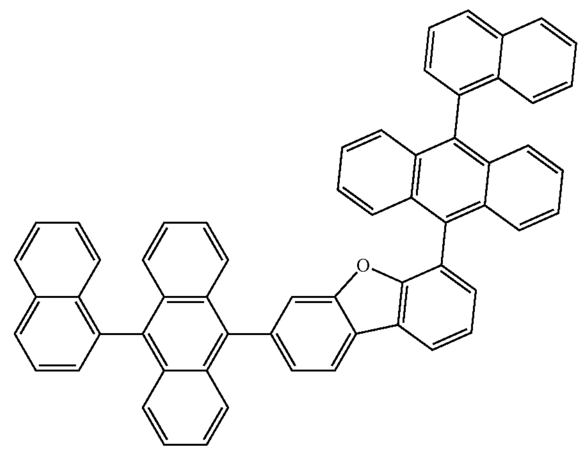

4

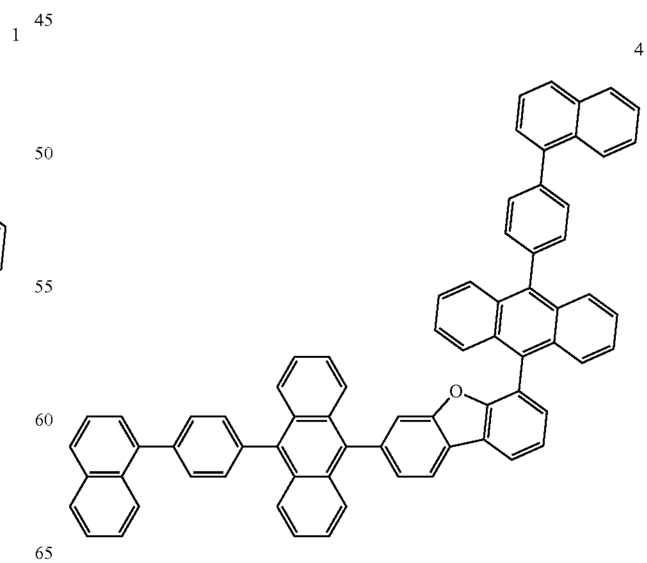

-continued
5
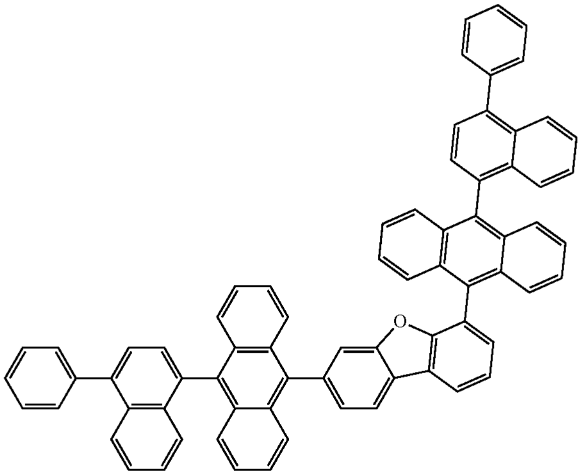
6
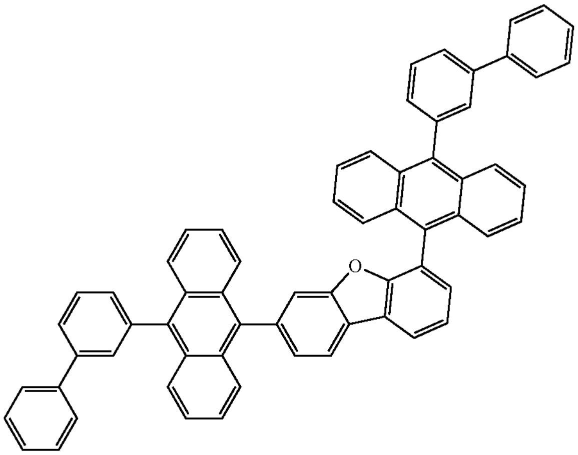
7
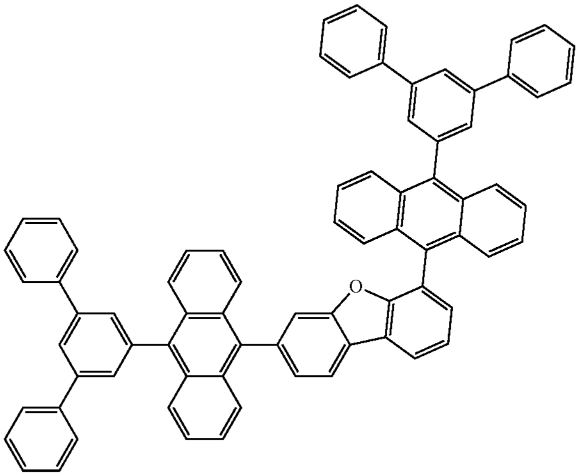
-continued
8
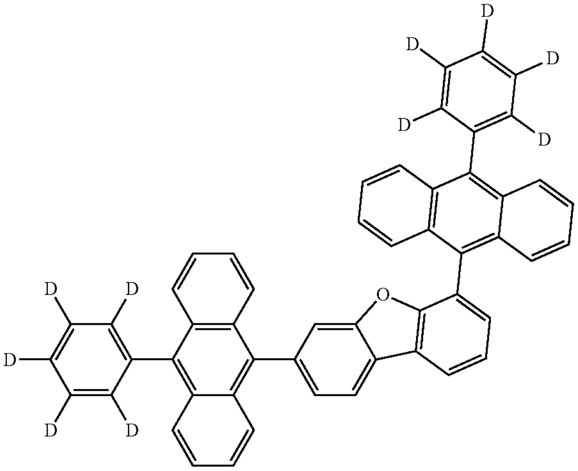
9
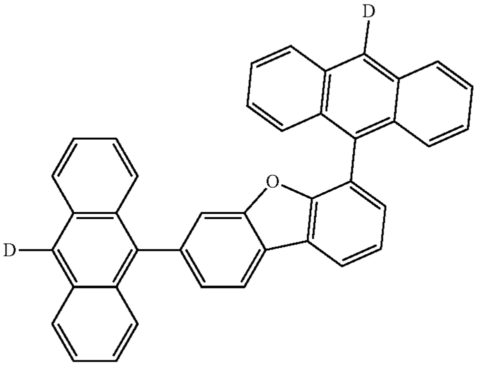
10
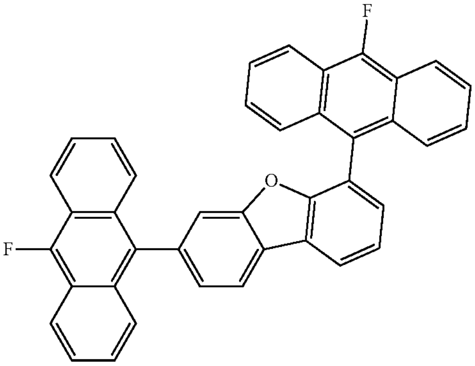
11
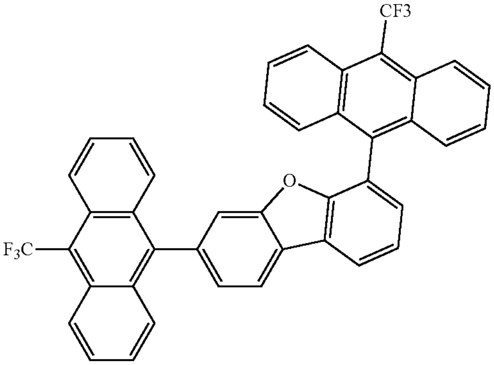

-continued
12
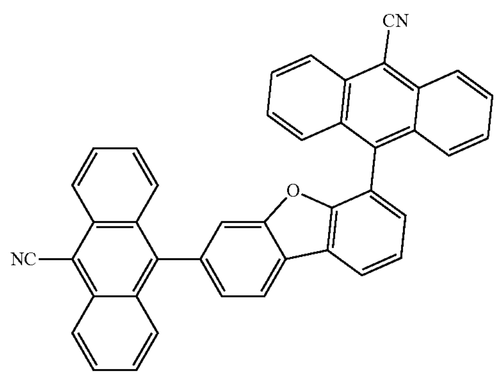
13
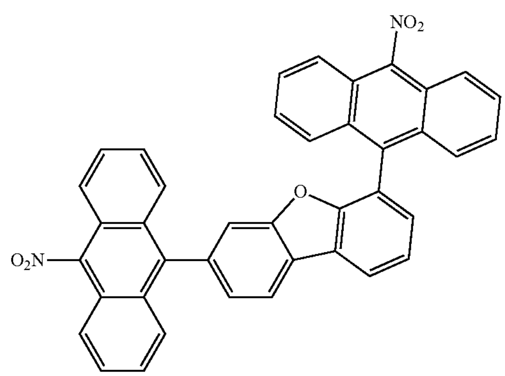
14
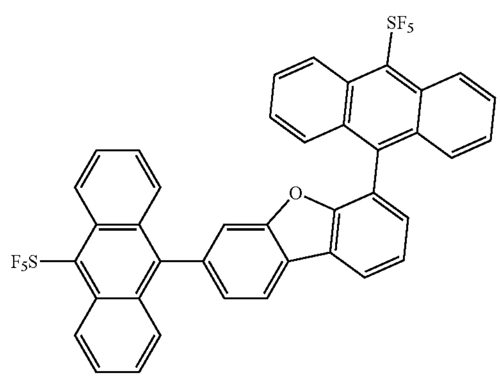
15
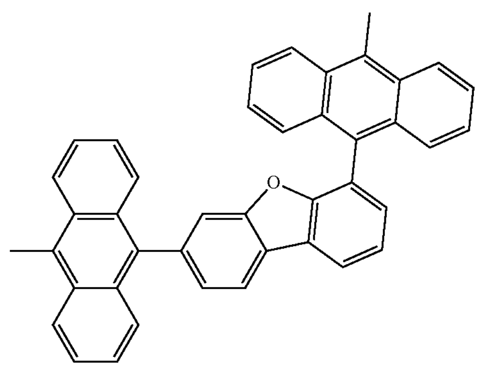
-continued
16
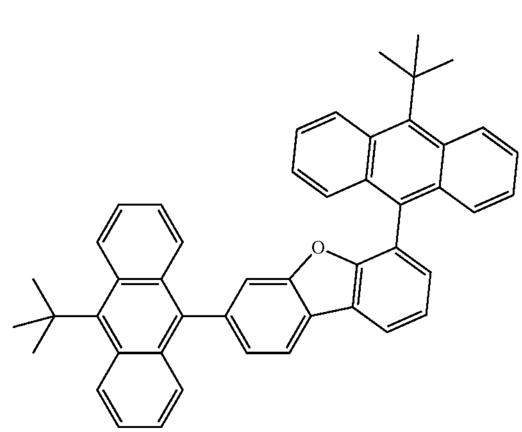
17
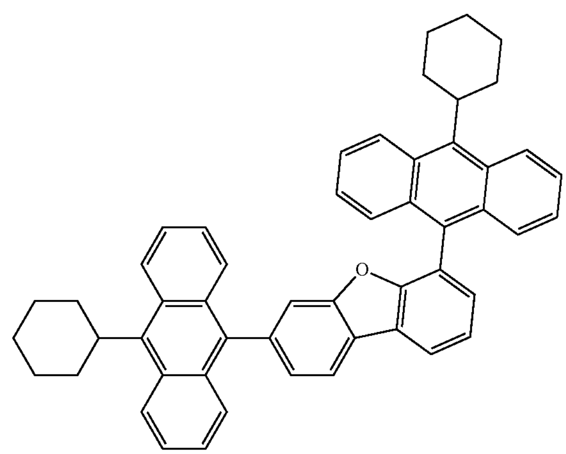
18
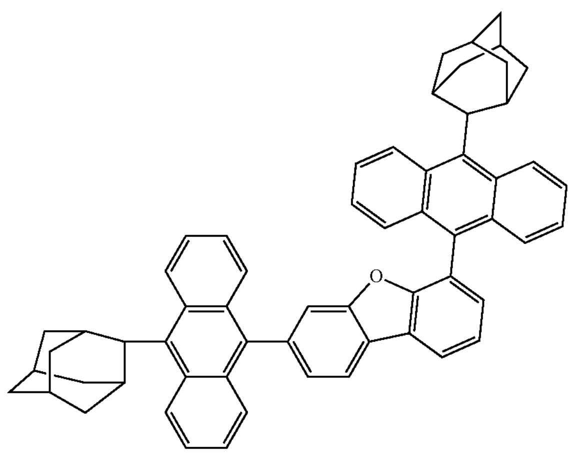

-continued
19
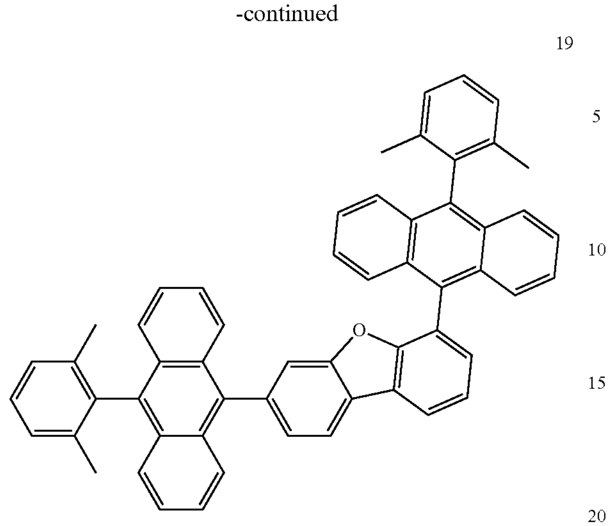
20
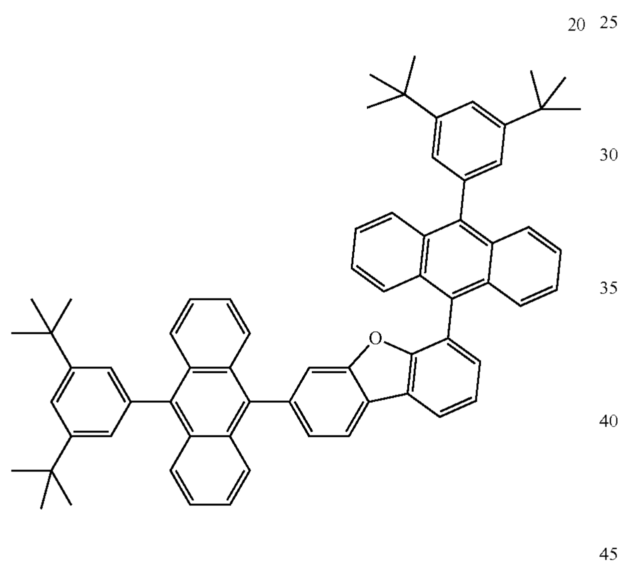
21
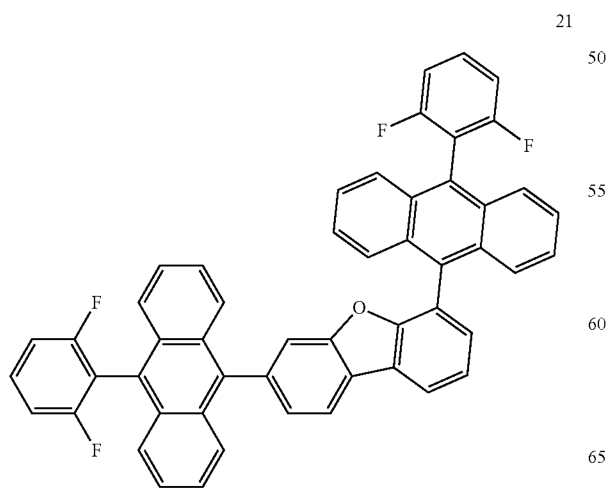
-continued
22
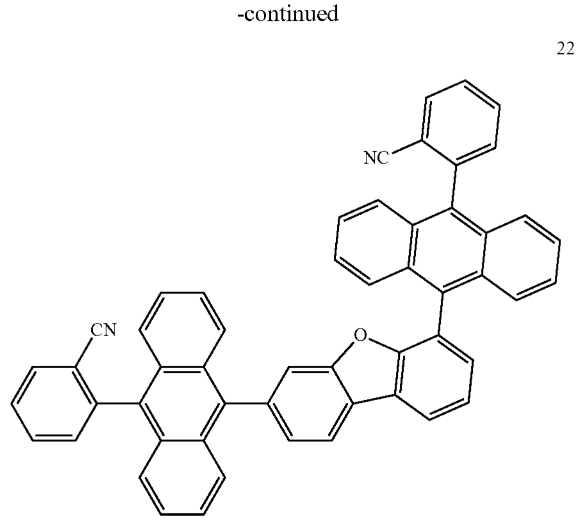
23
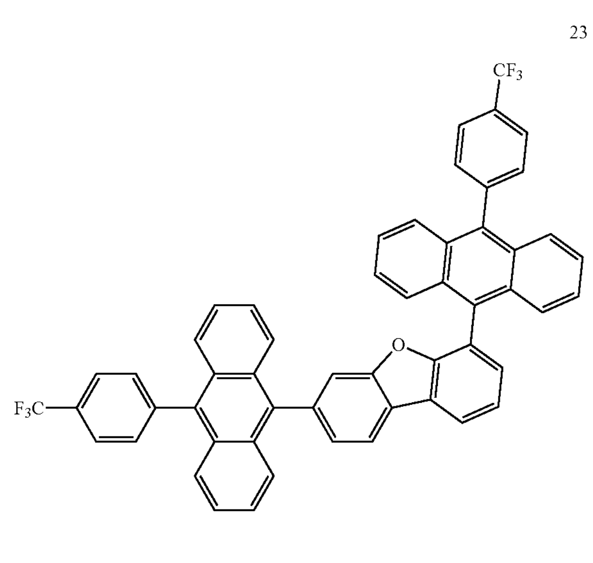
24
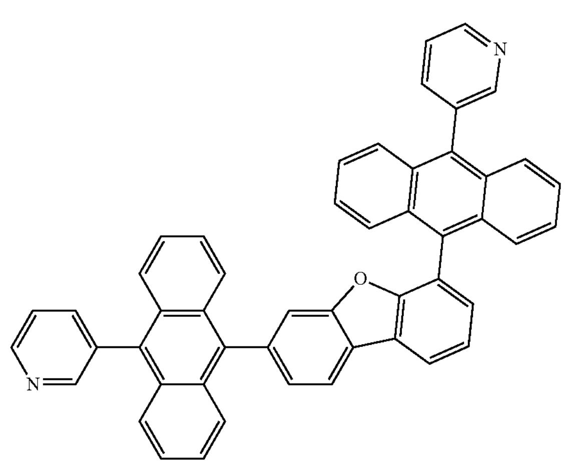

-continued
25
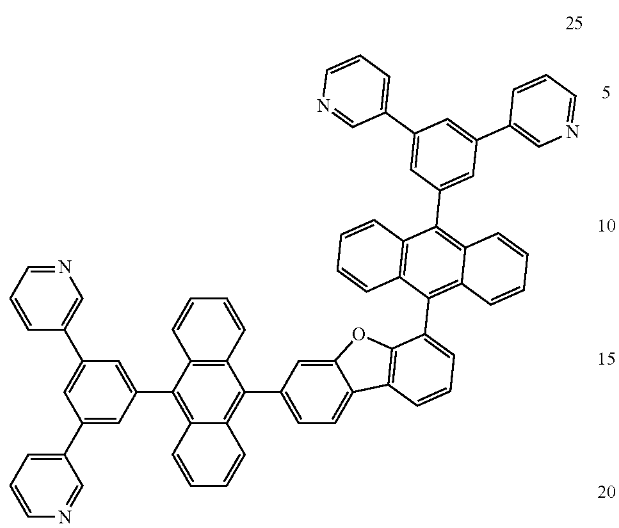
26
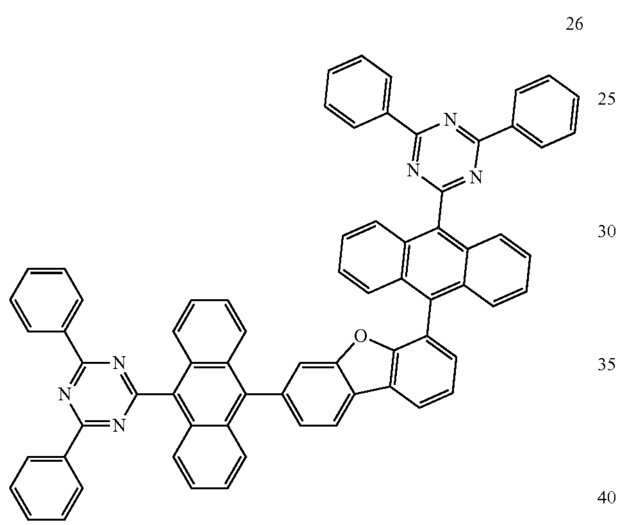
27
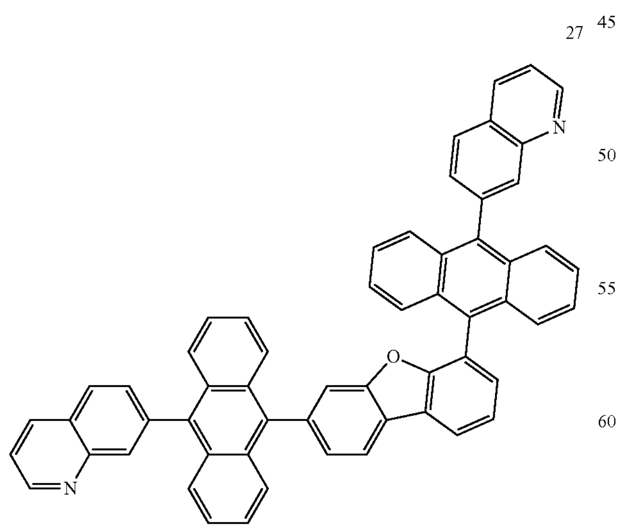
-continued
28
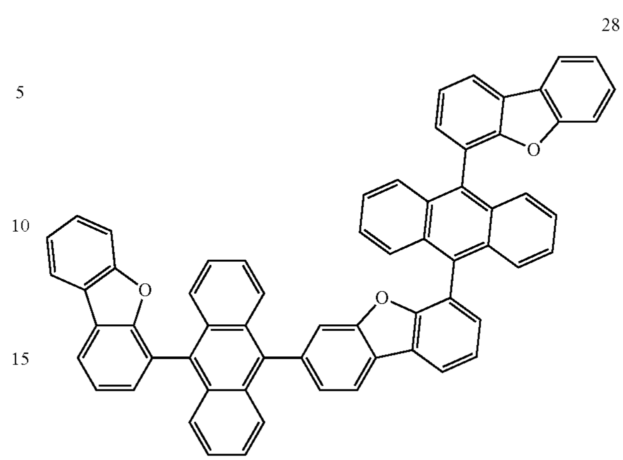
29
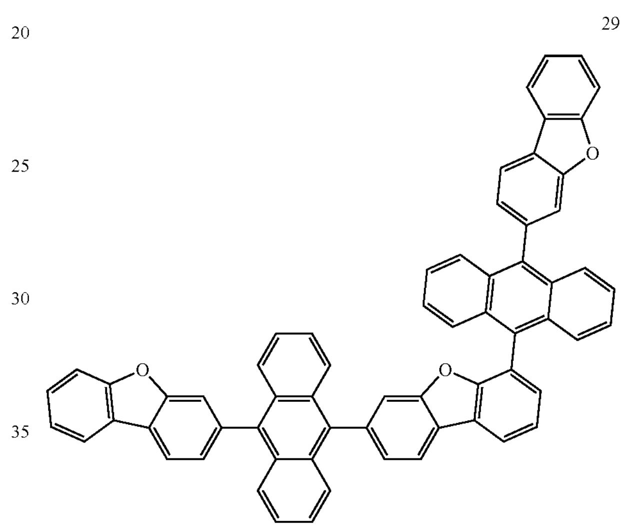
30
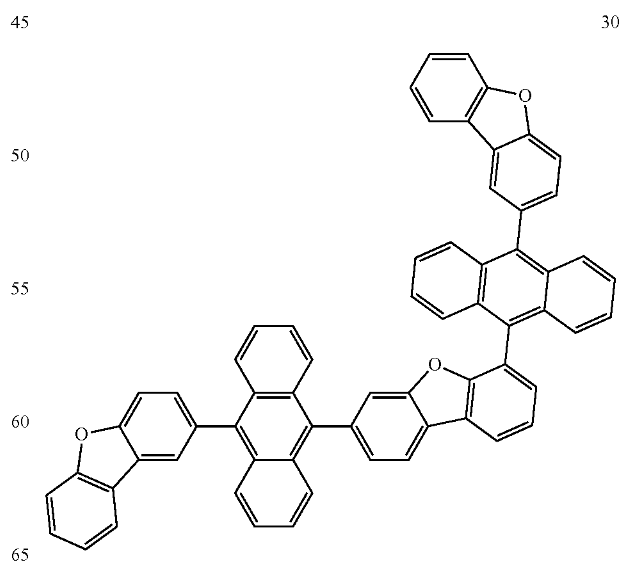

-continued
31
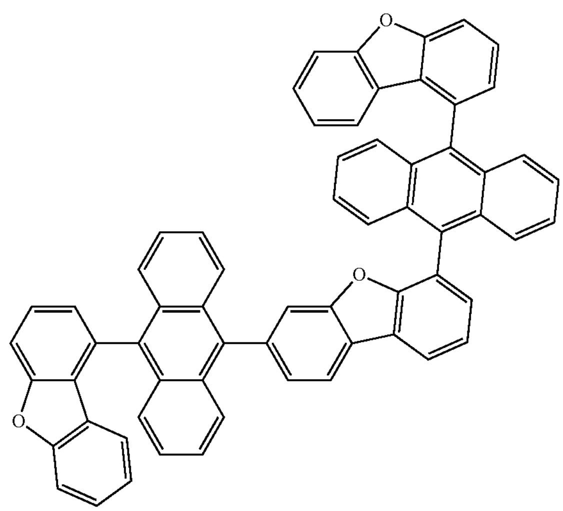
33
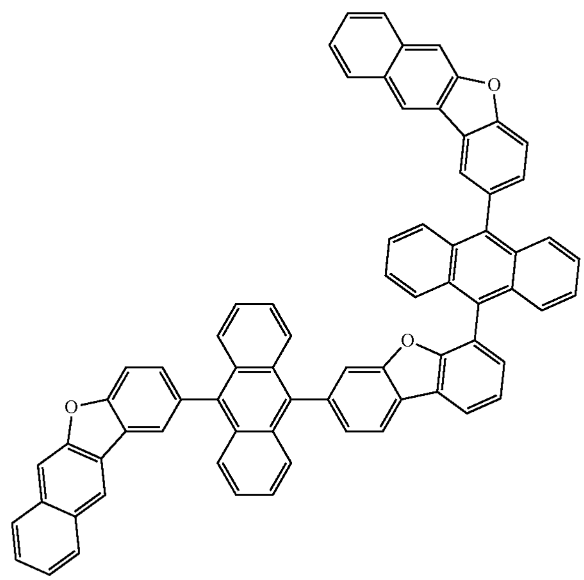
32
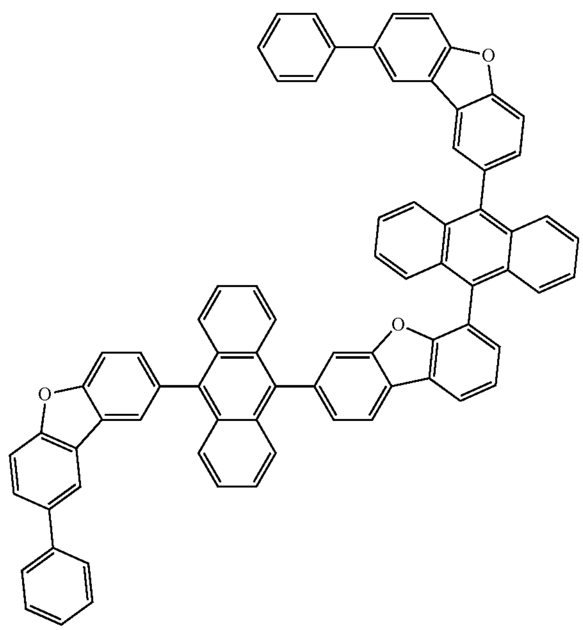
34
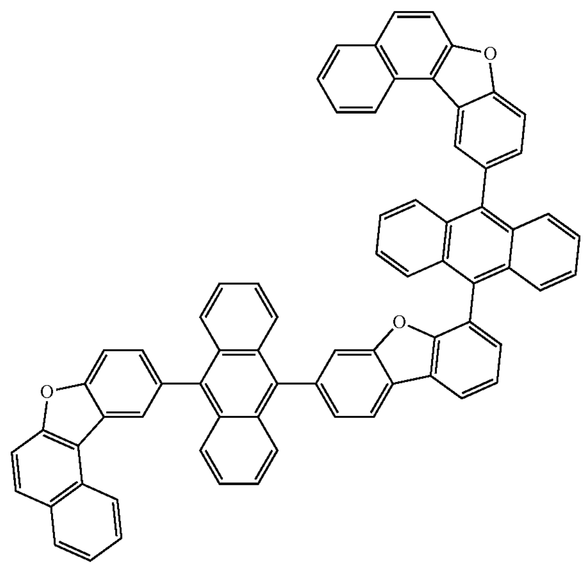

-continued
35
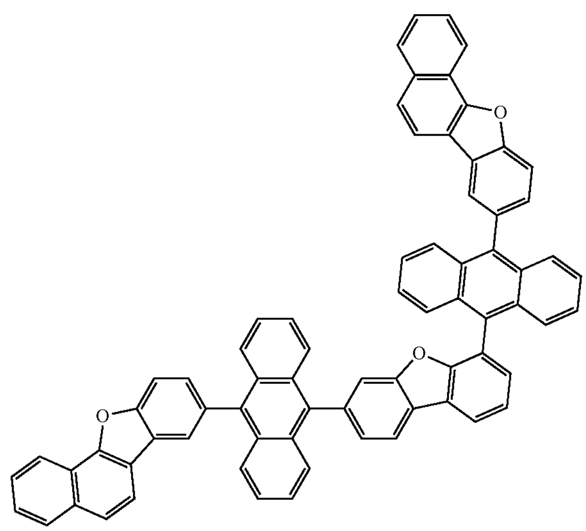
36
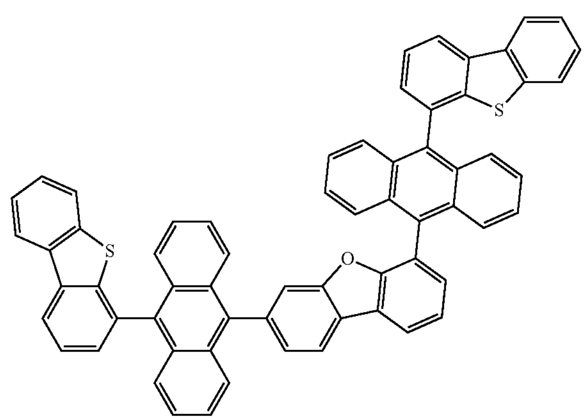
37
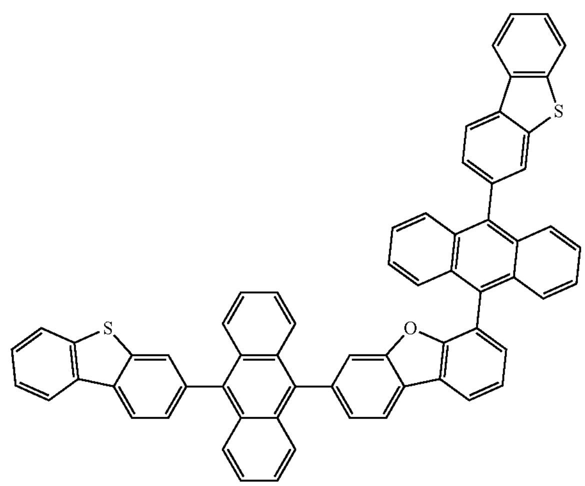
-continued
38
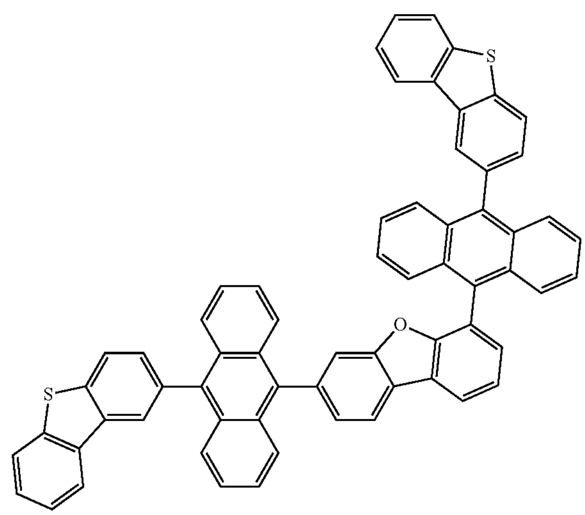
39
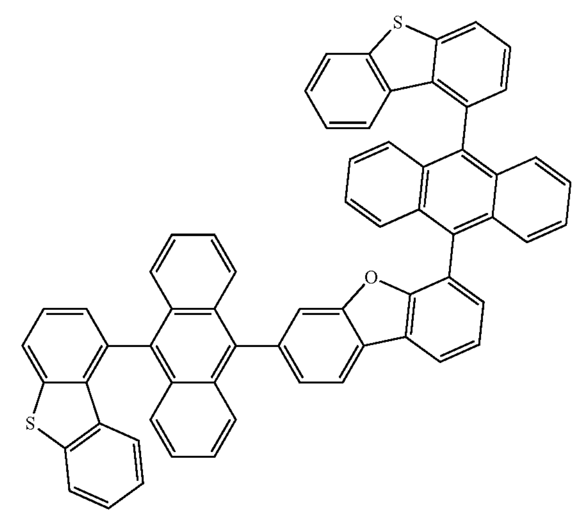

-continued
40
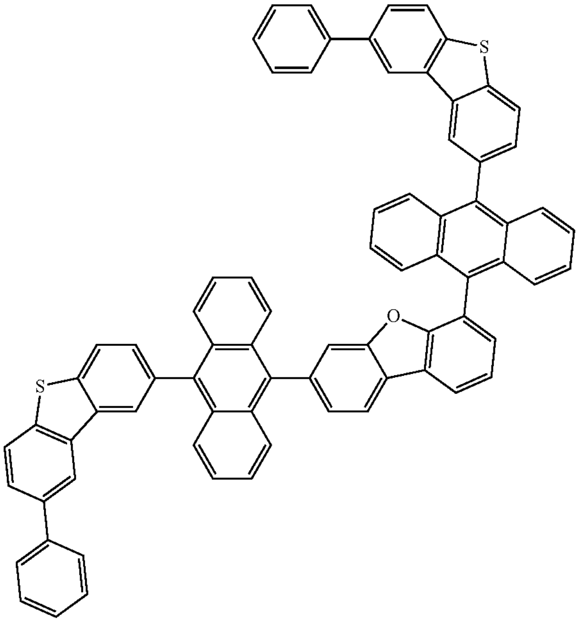
41
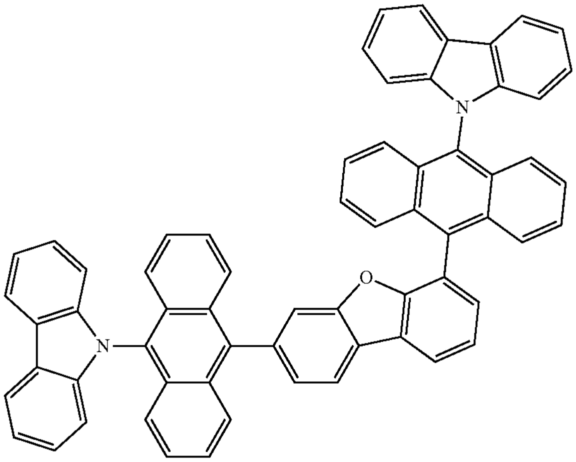
42
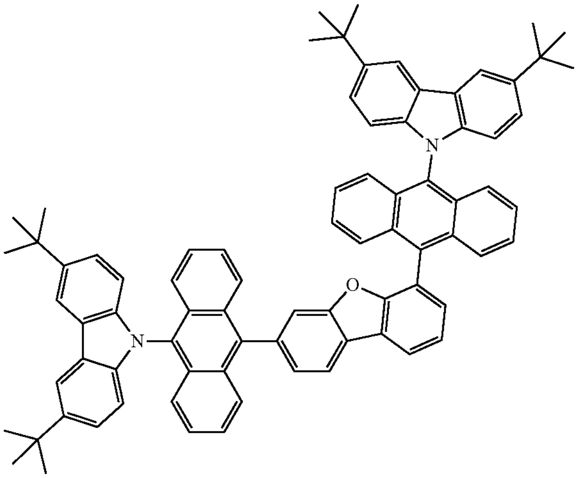
-continued
43
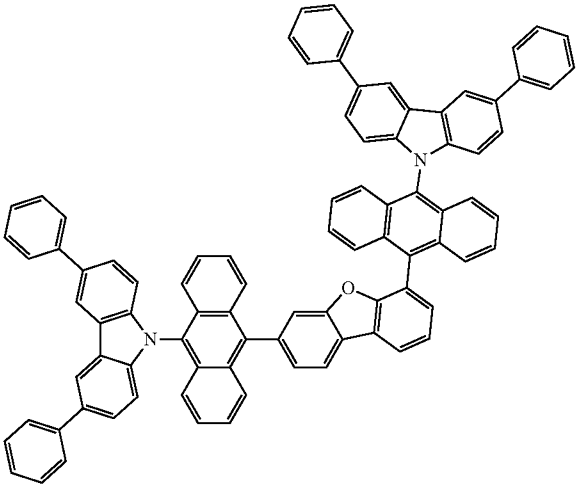
44
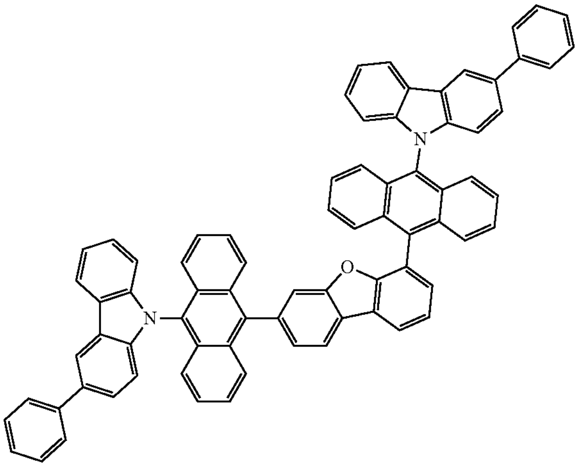
45
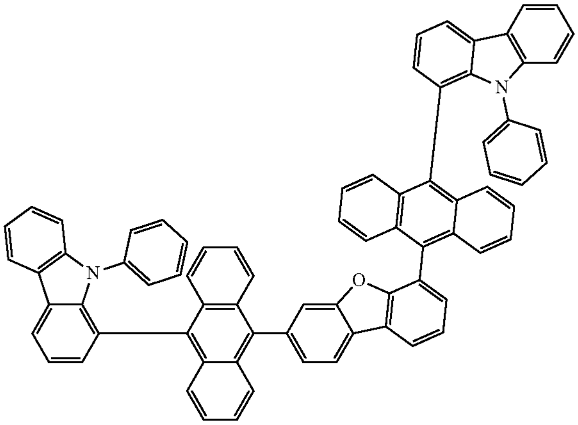

-continued
46
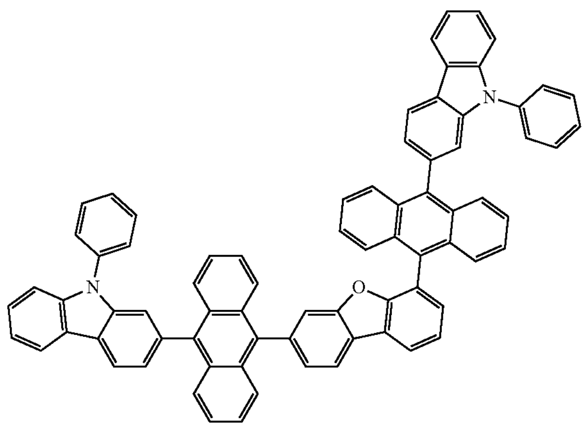
47
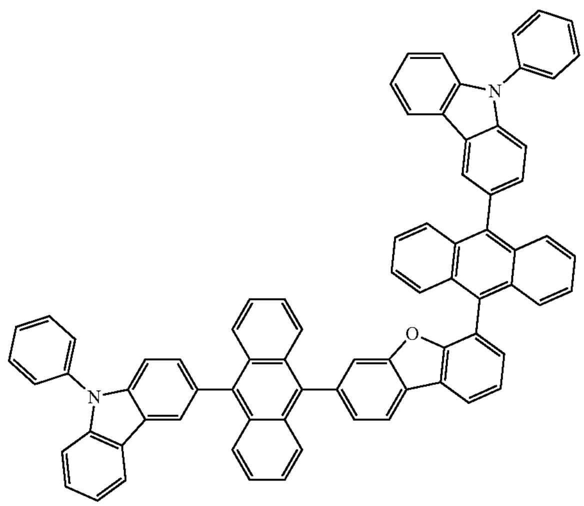
48
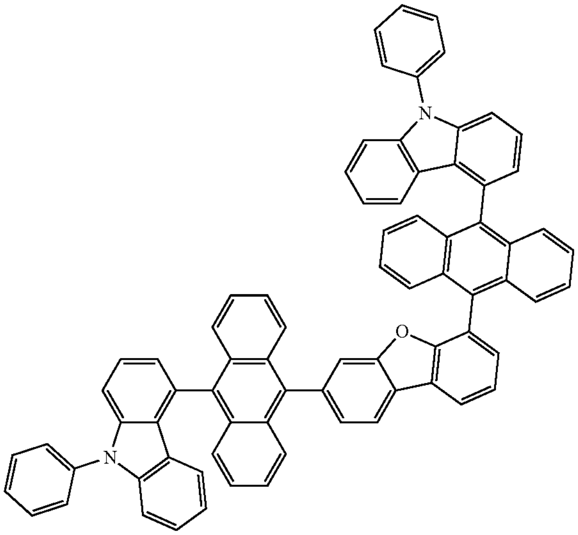
-continued
49
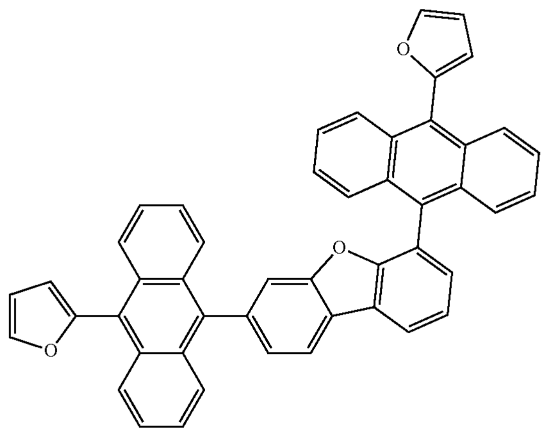
50
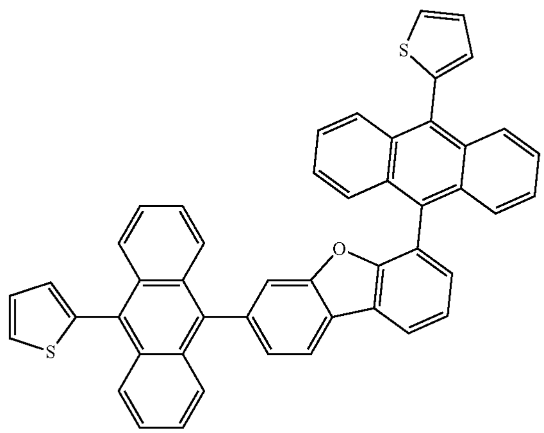
51
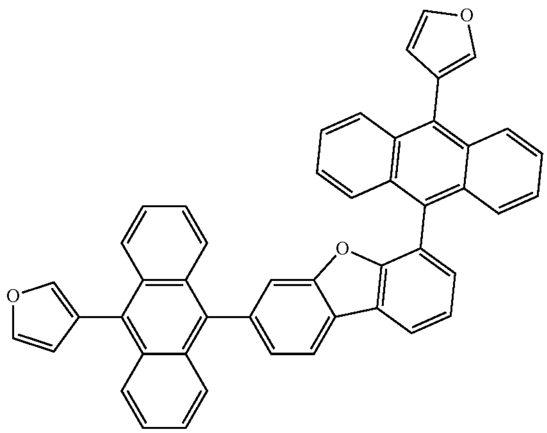

-continued
52
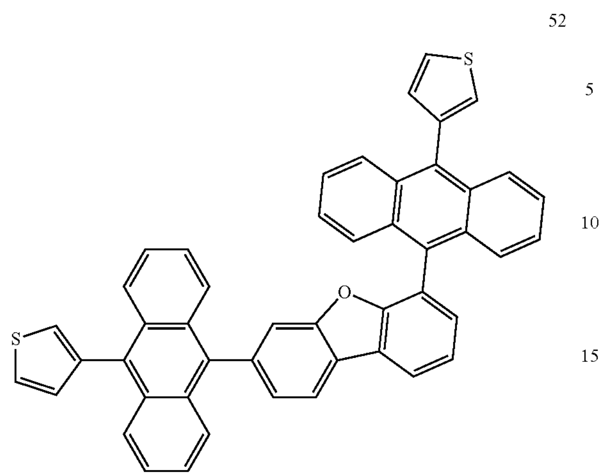
53
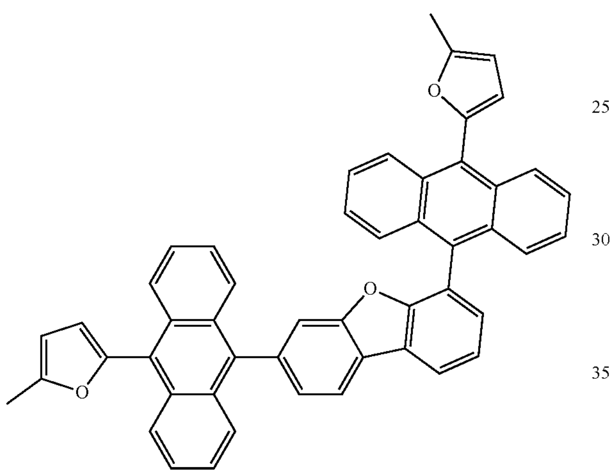
54
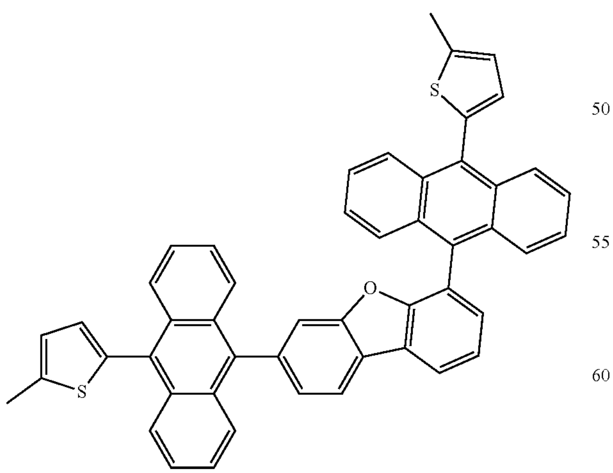
-continued
55
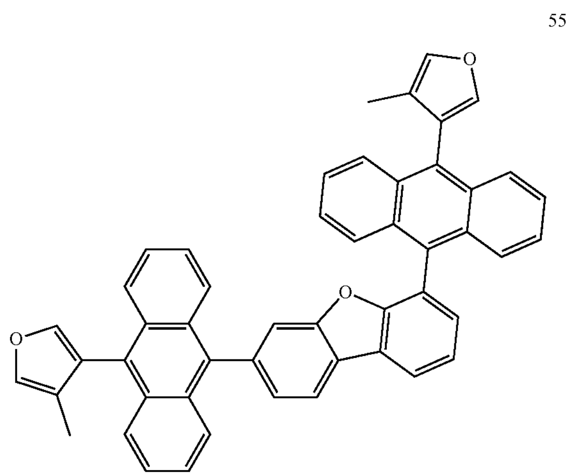
56
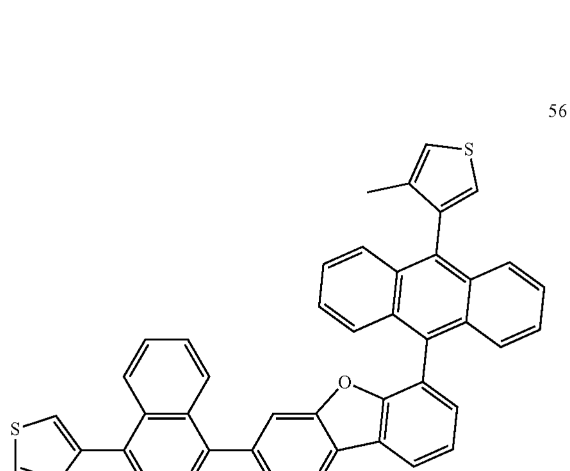
57
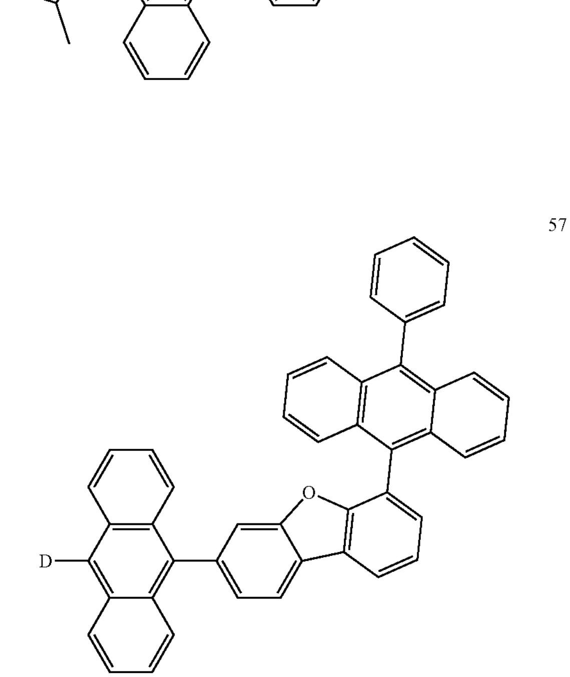

-continued
58
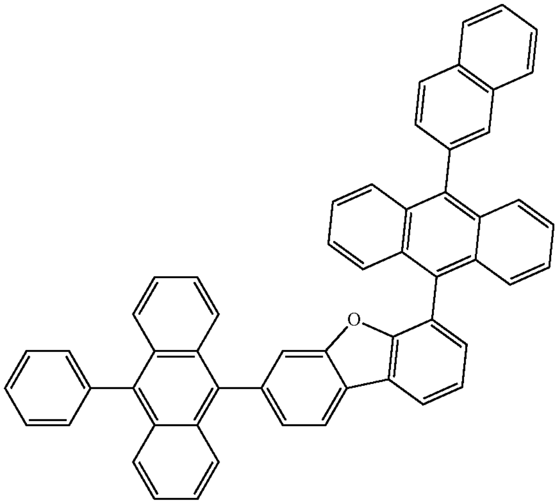
59
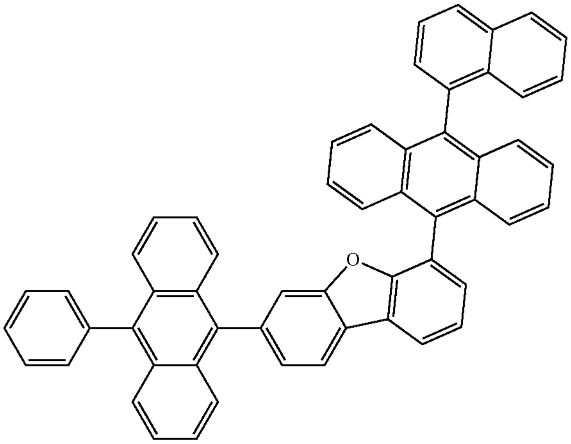
60
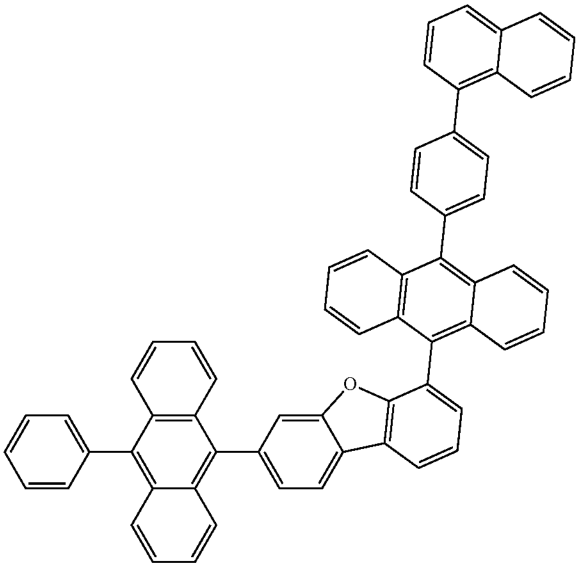
-continued
61
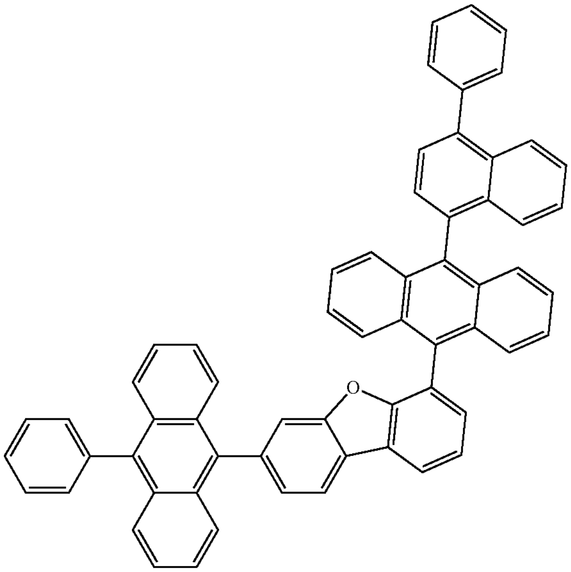
62
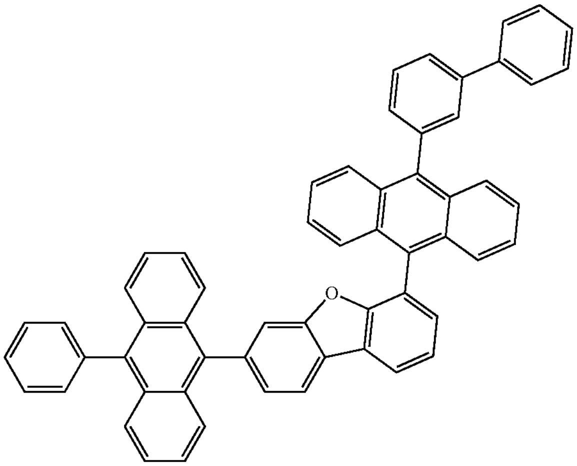
63
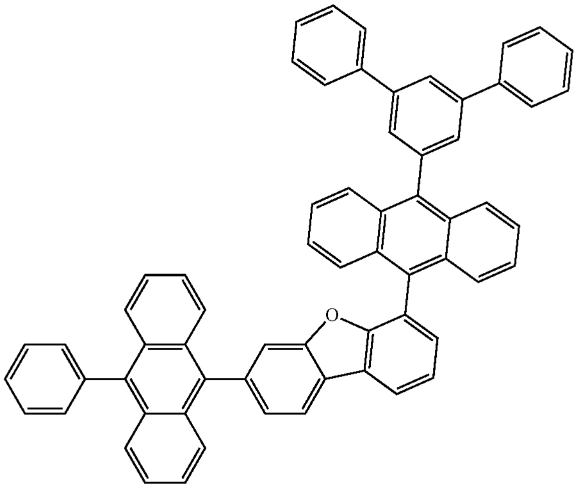

-continued
64
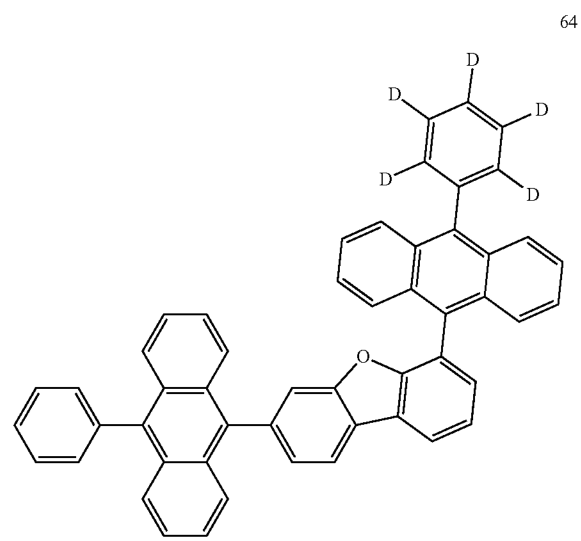
65
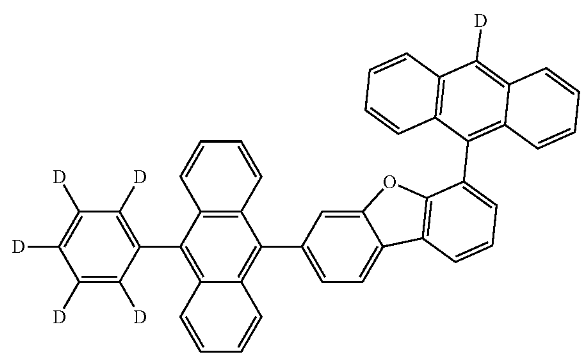
66
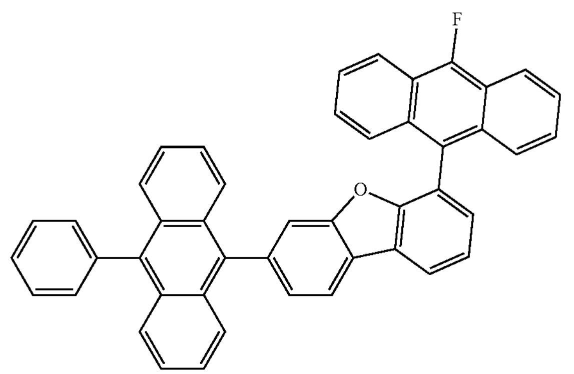
-continued
67
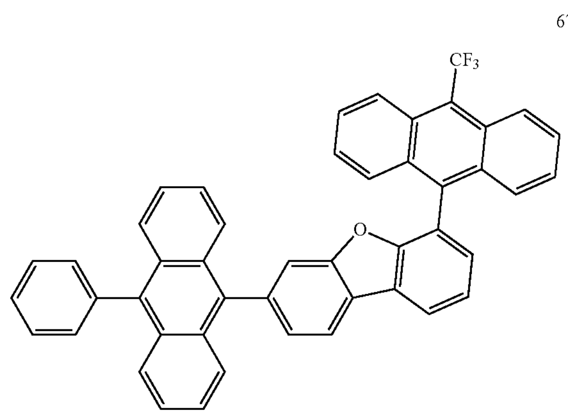
68
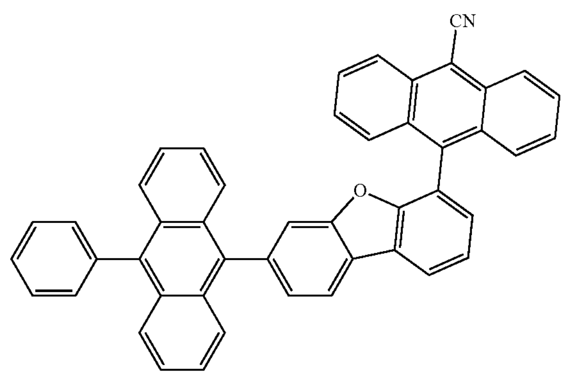
69
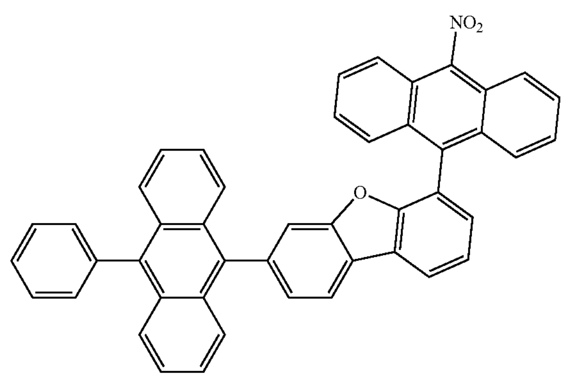
70
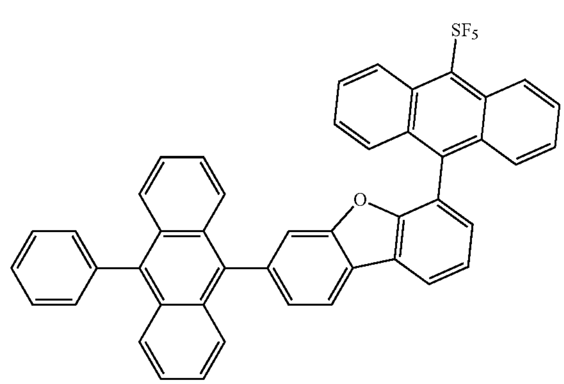

-continued
71
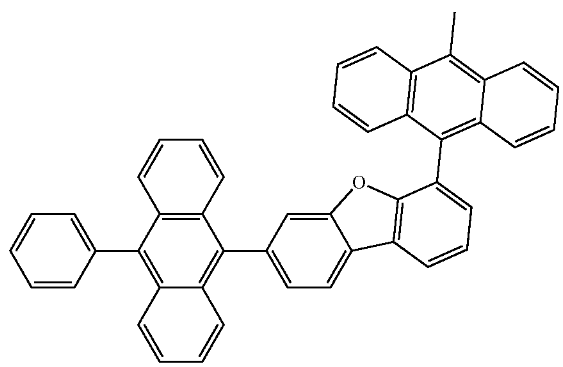
72
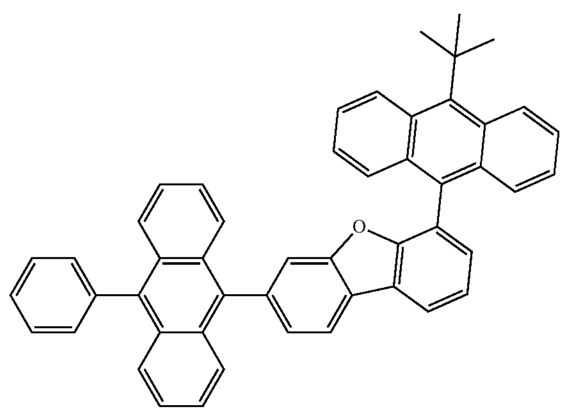
73
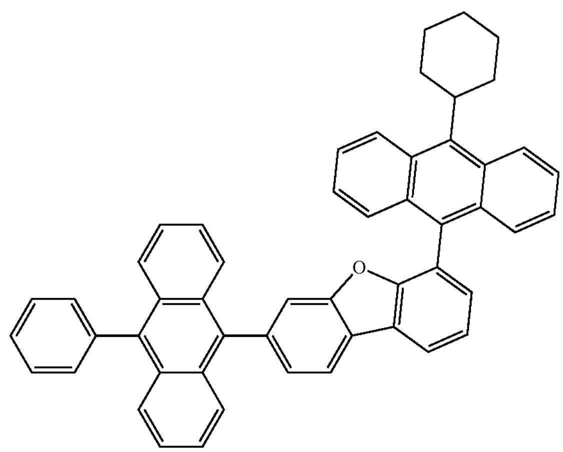
-continued
74
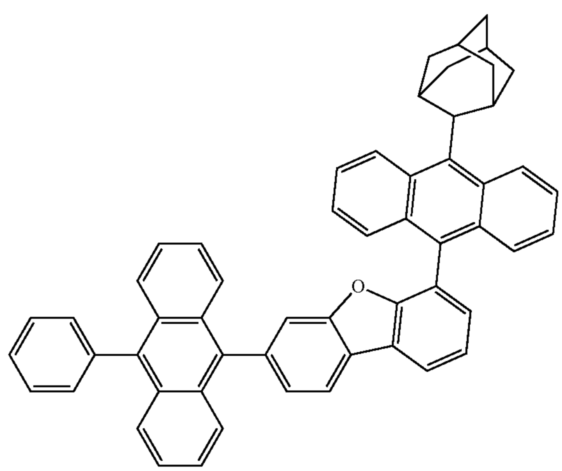
75
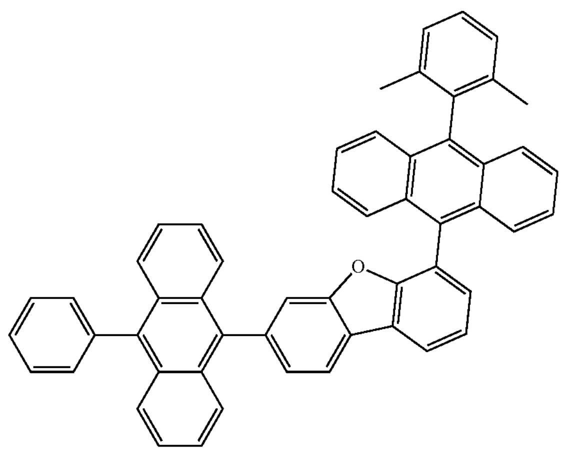
76
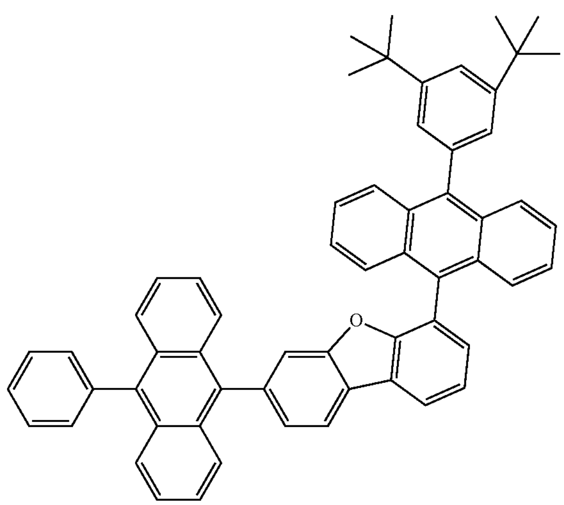

-continued
77
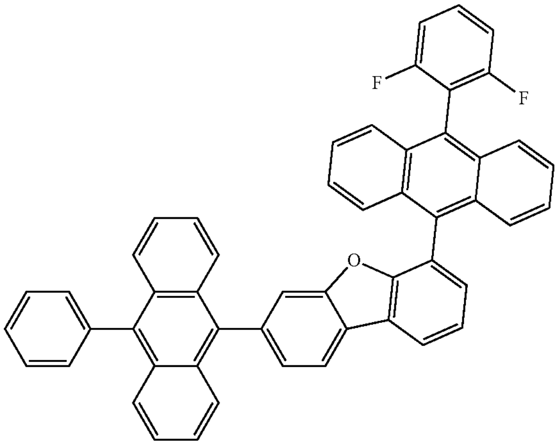
78
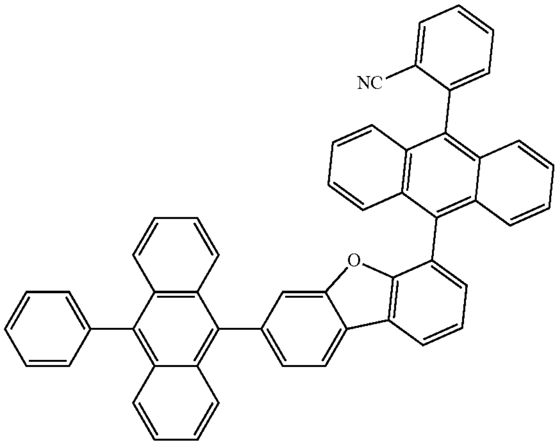
79
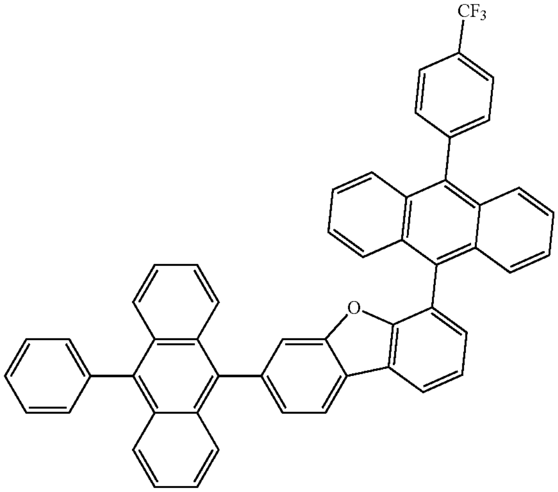
-continued
80
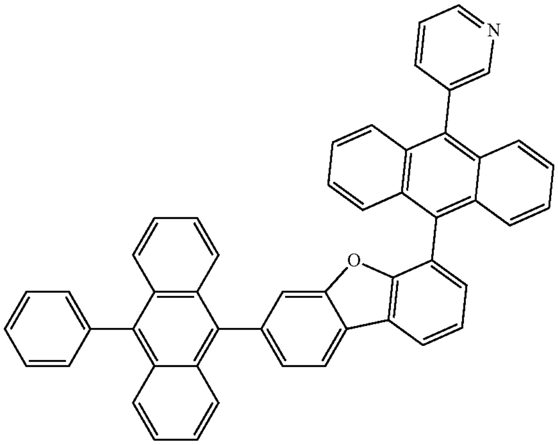
81
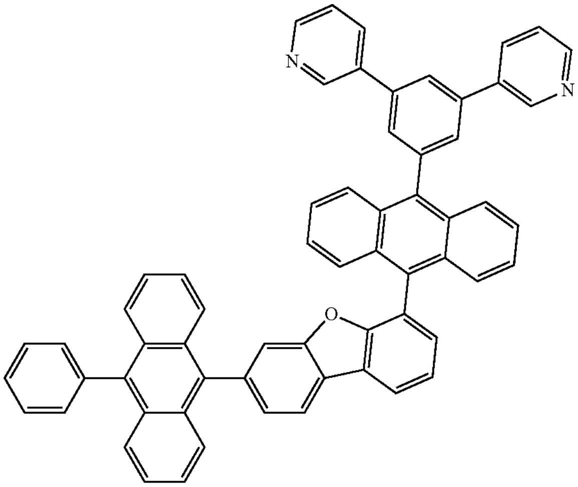
82
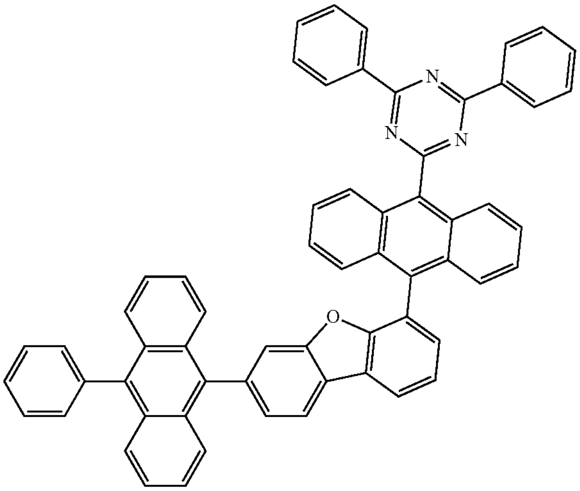

83
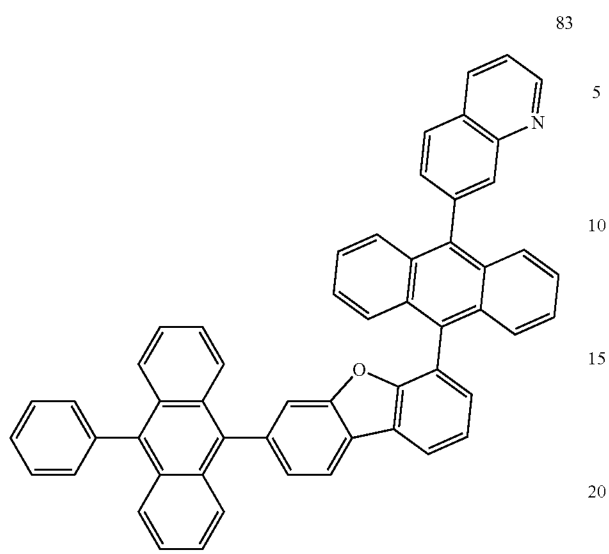
84
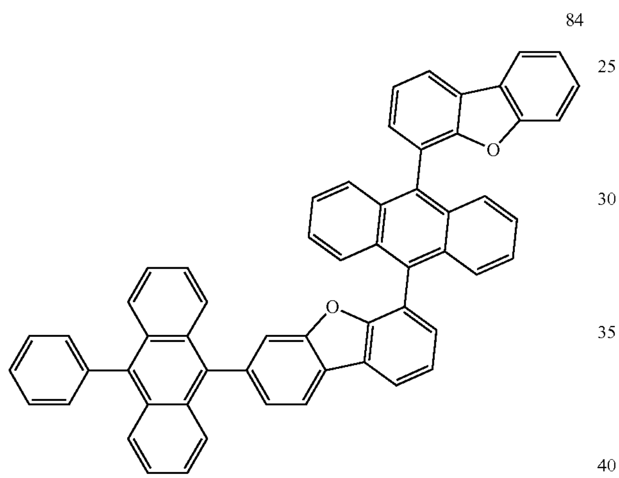
85
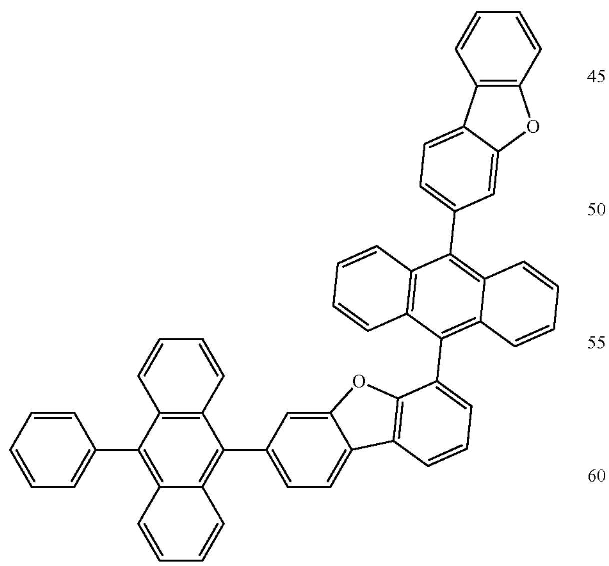
86
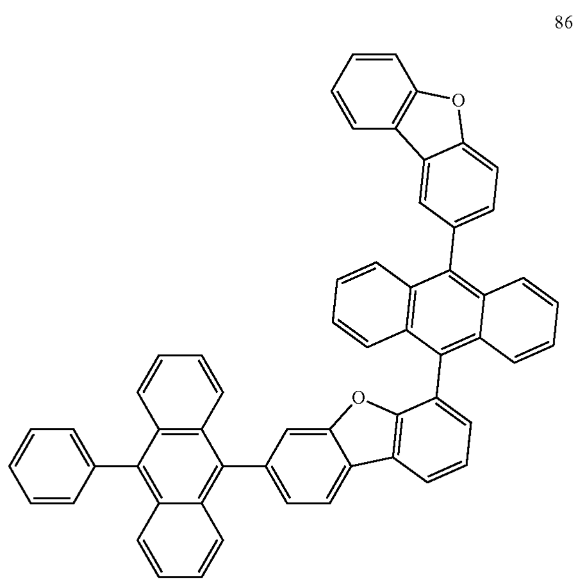
87
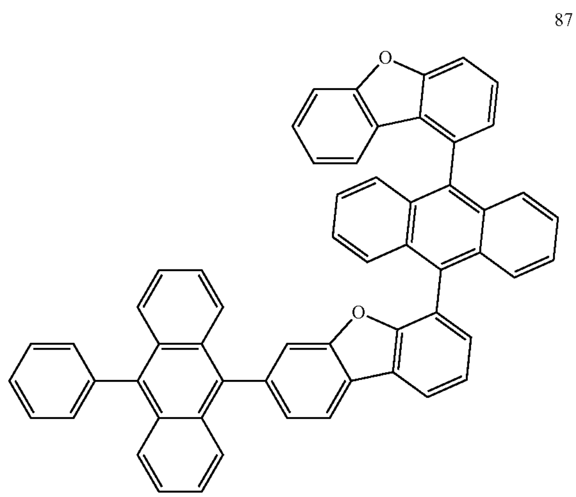
88
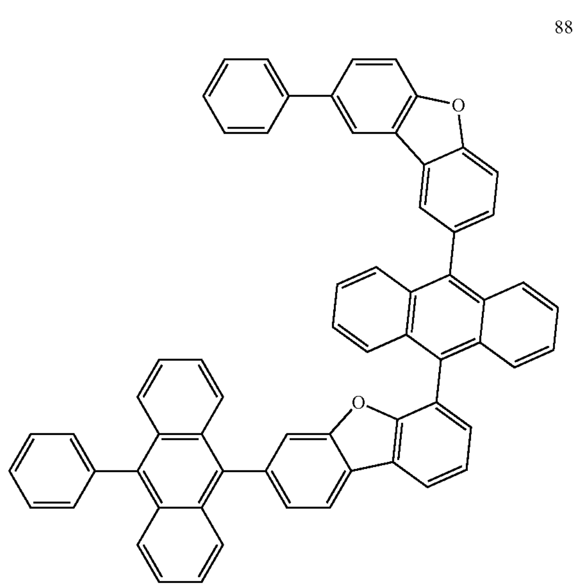

-continued
89
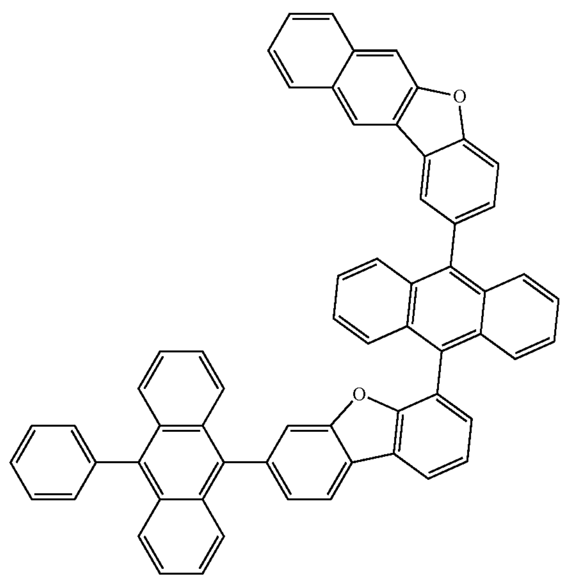
90
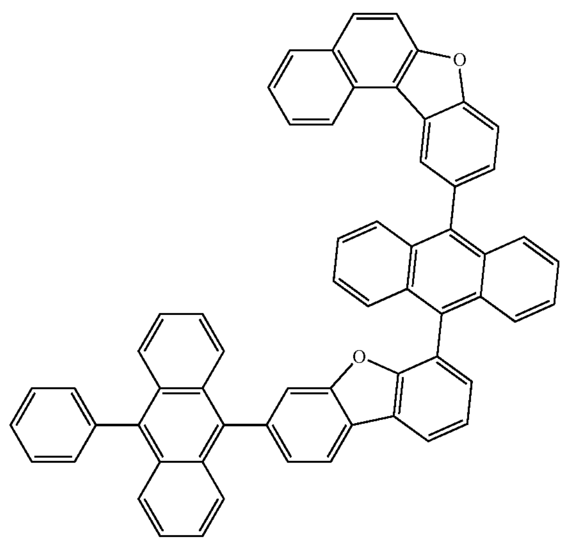
91
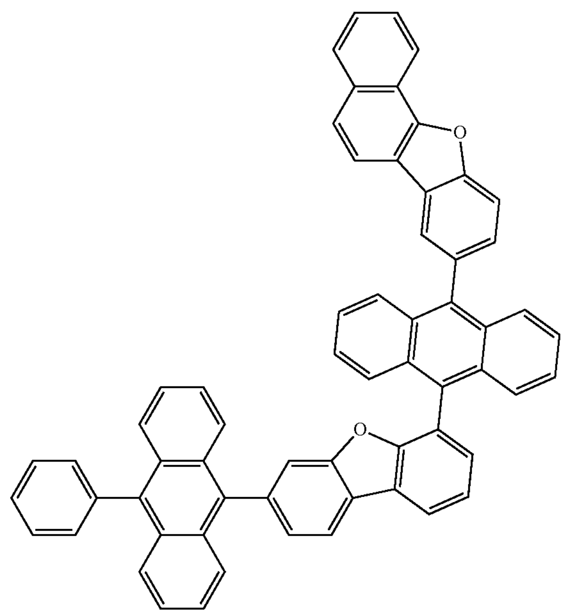
92
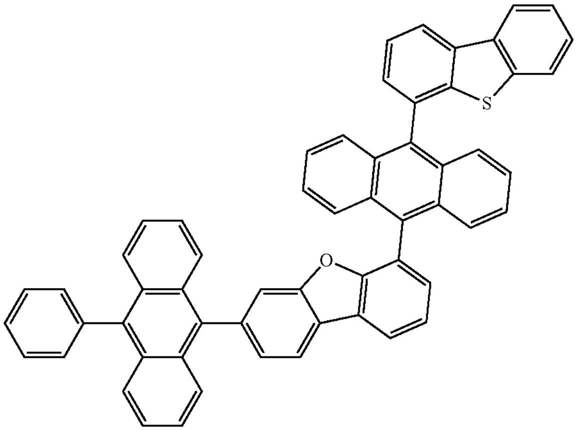
93
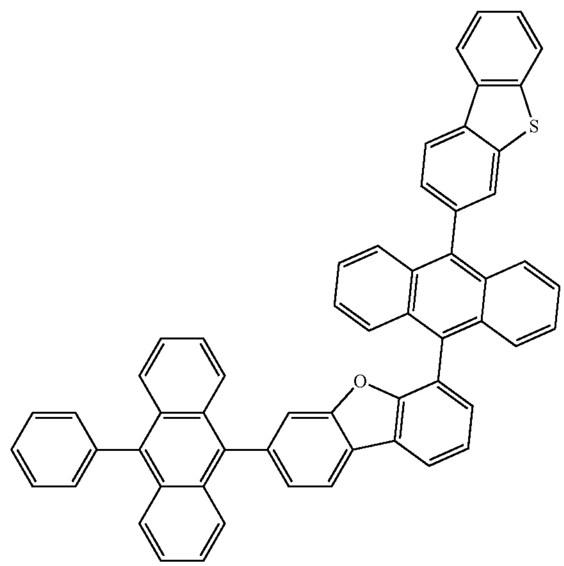

-continued
94
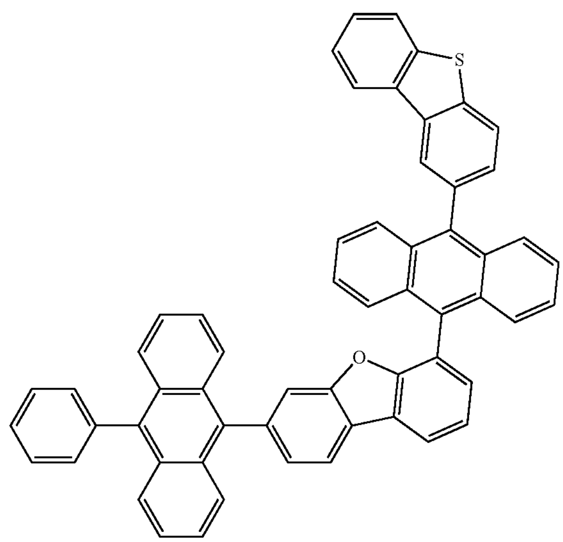
95
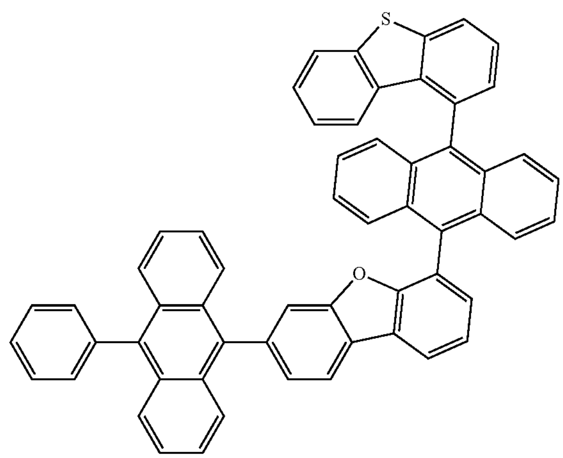
96
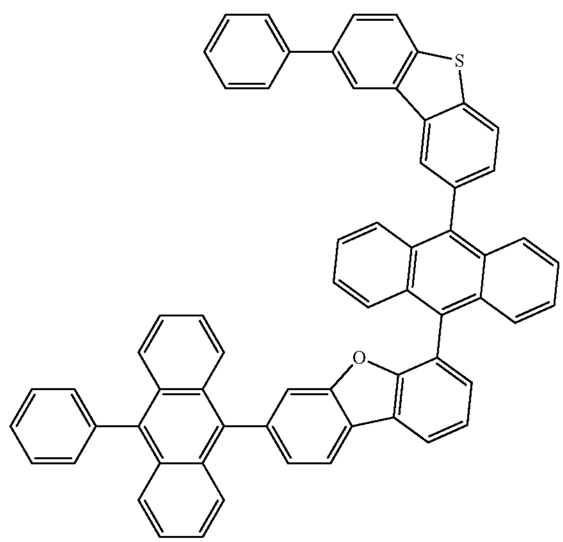
-continued
97
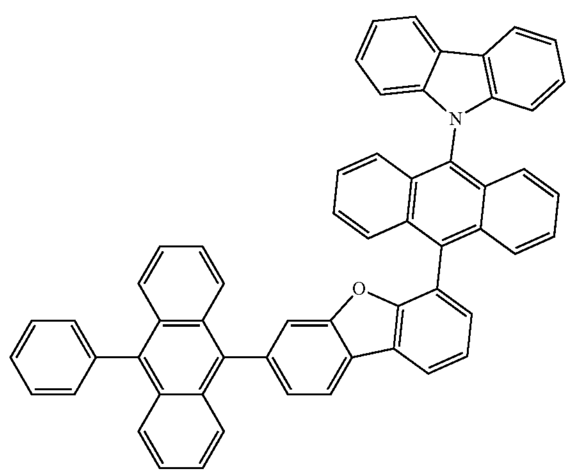
98
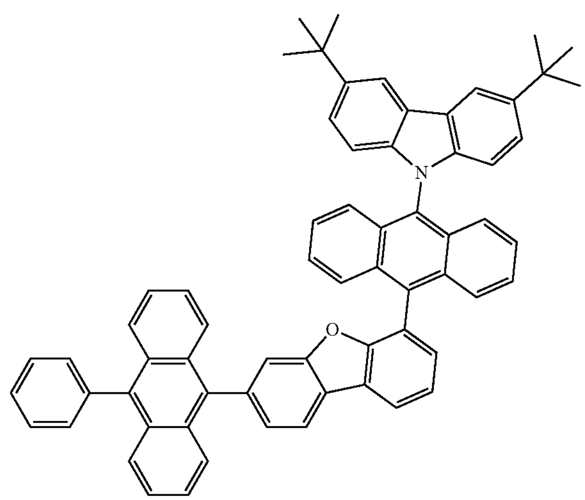
99
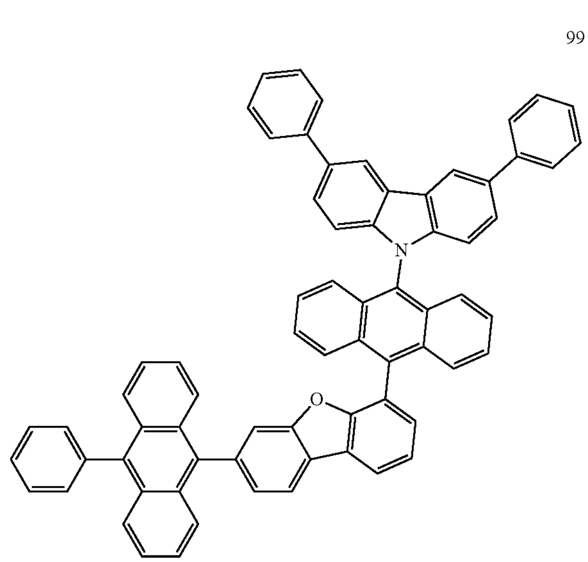

-continued
100
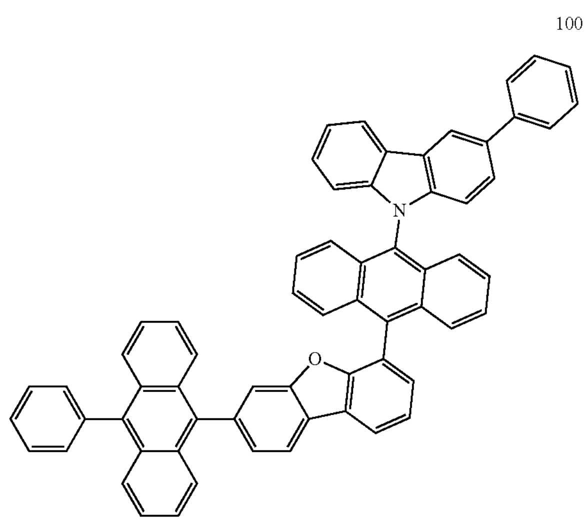
101
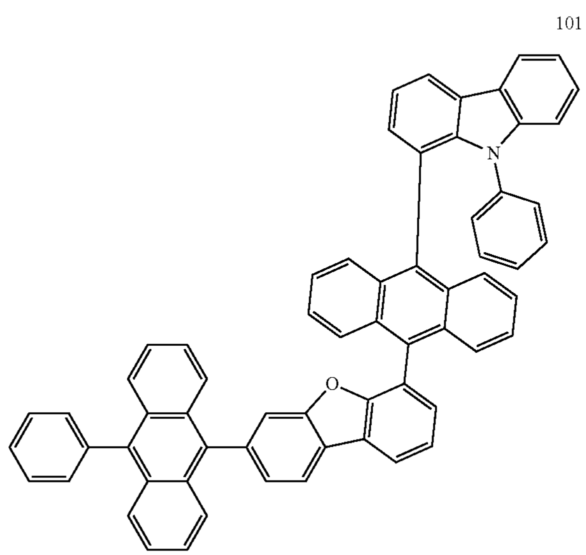
102
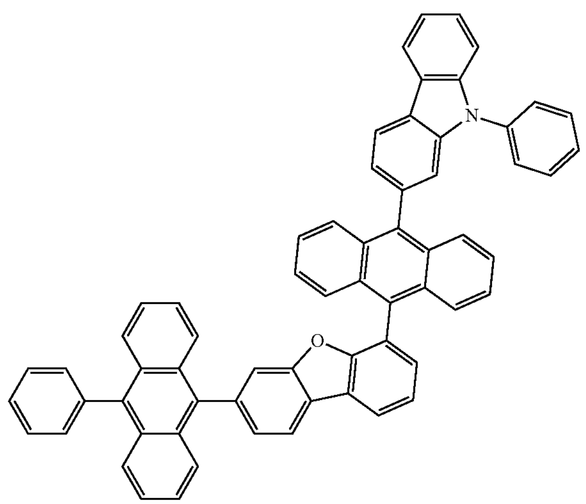
-continued
103
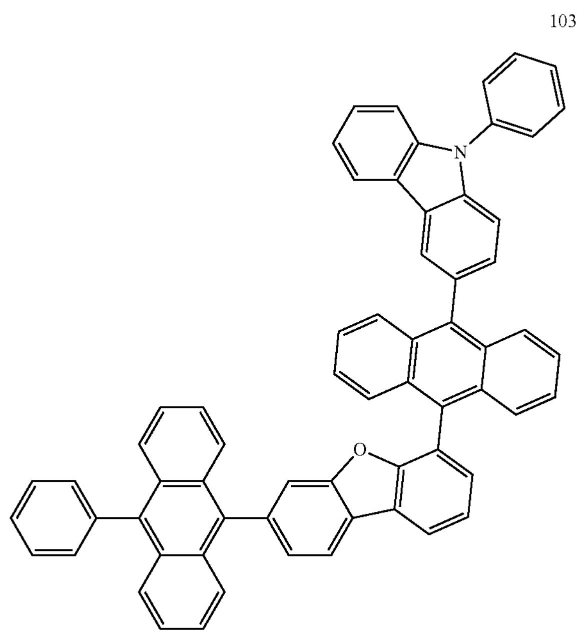
104
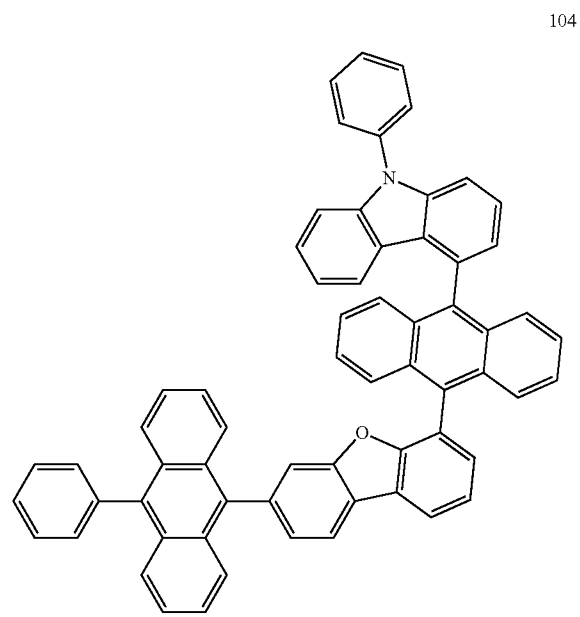
105
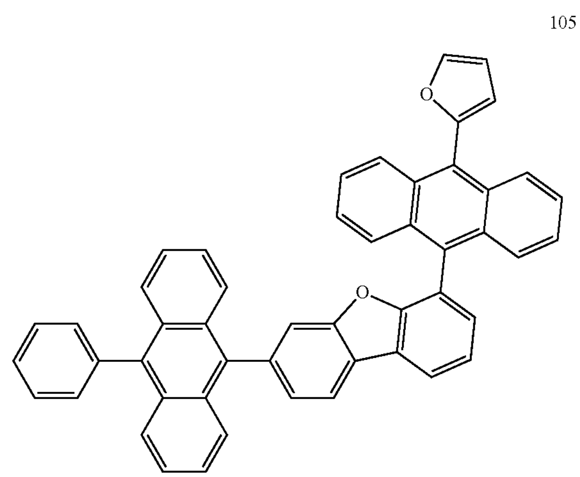

-continued
106
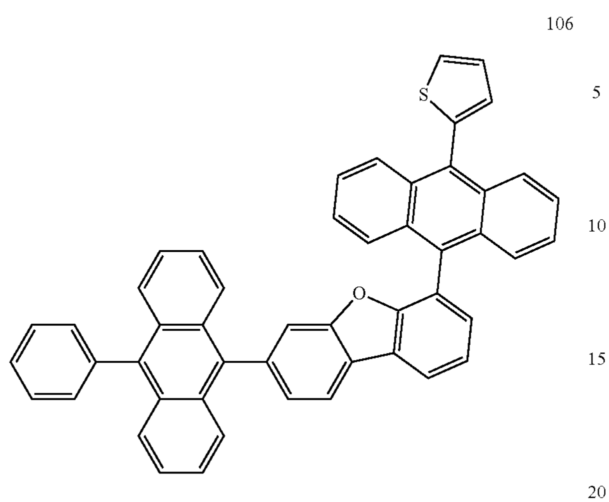
107
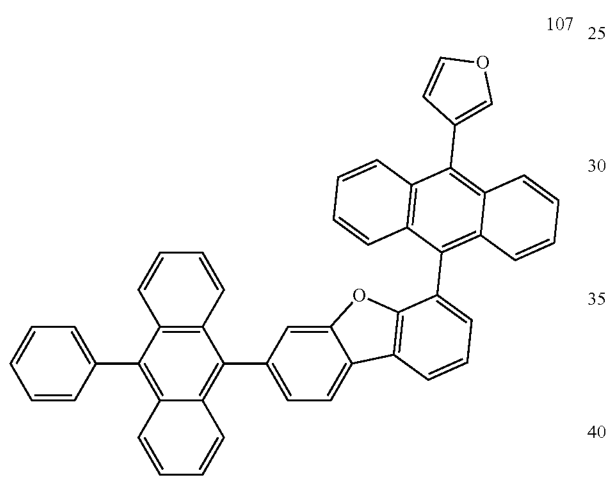
108
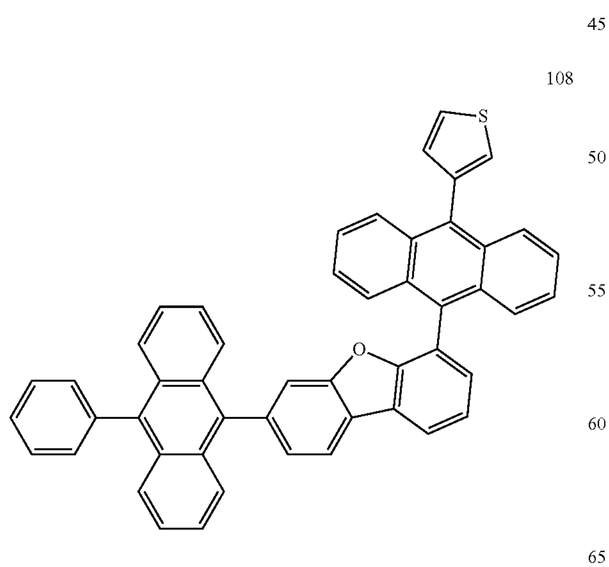
-continued
109
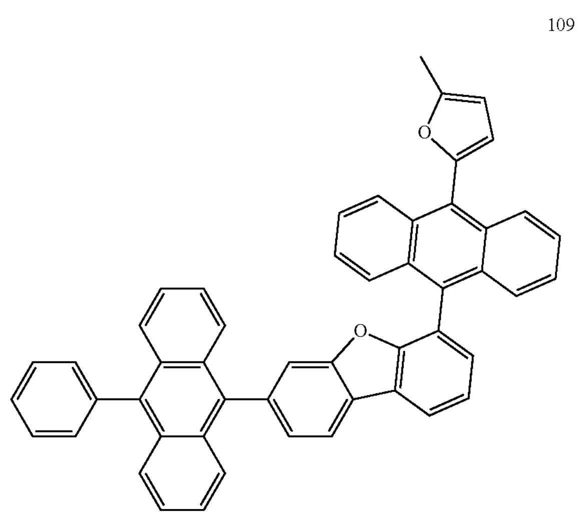
110
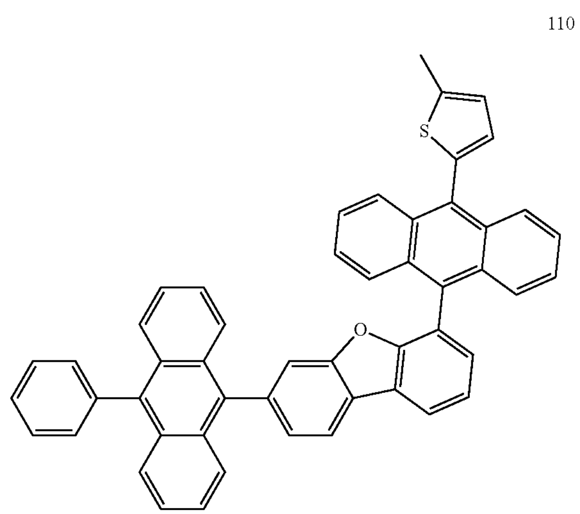
111
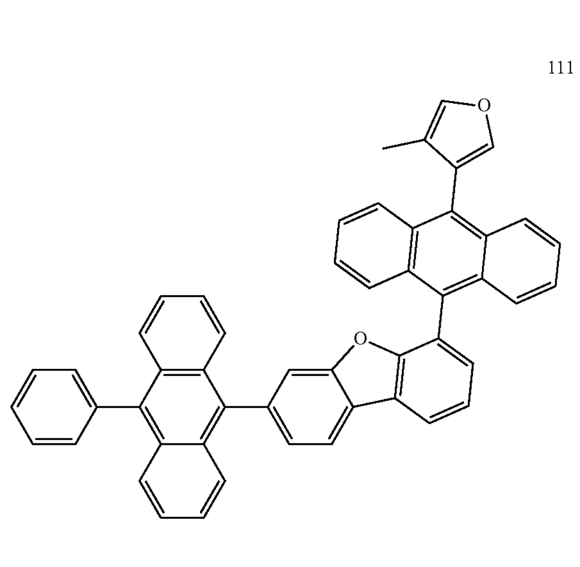

112
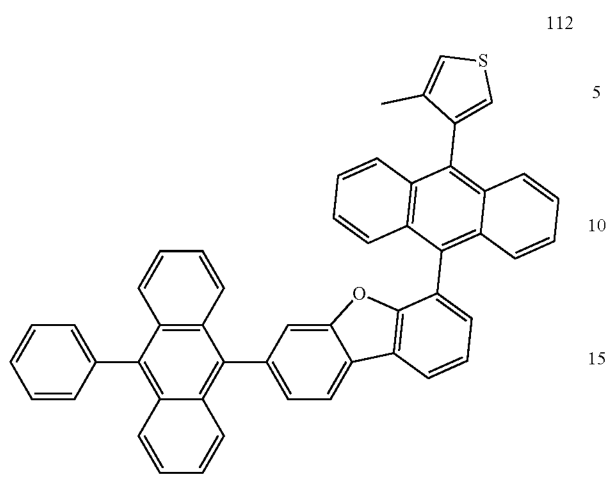
113
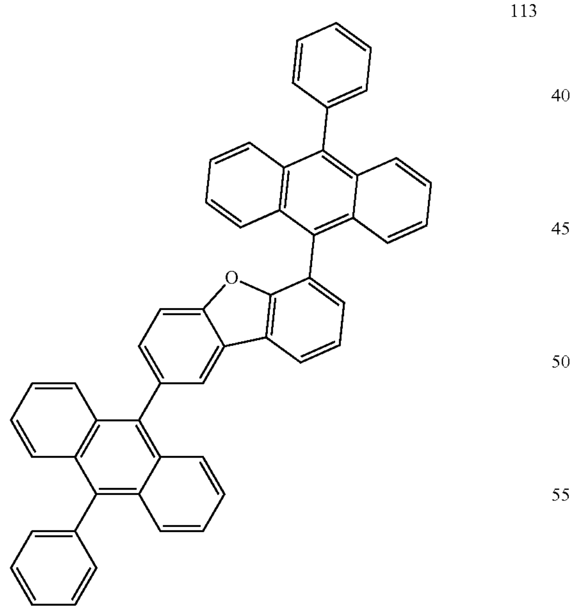
114
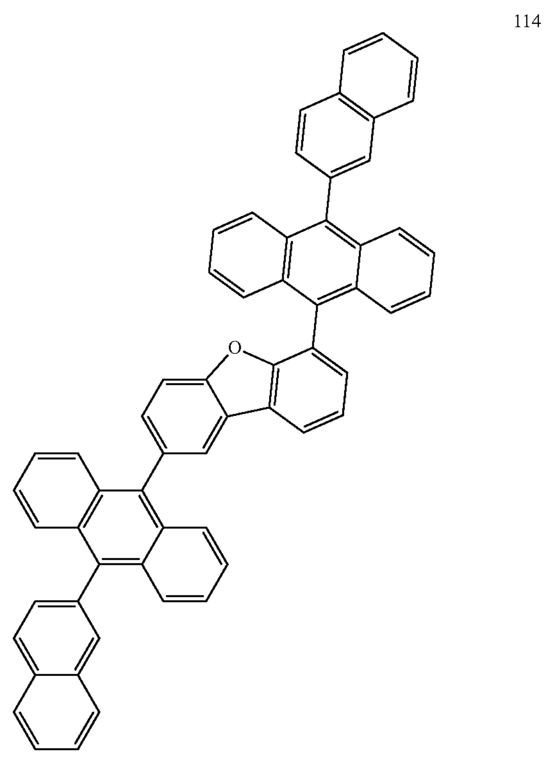
115
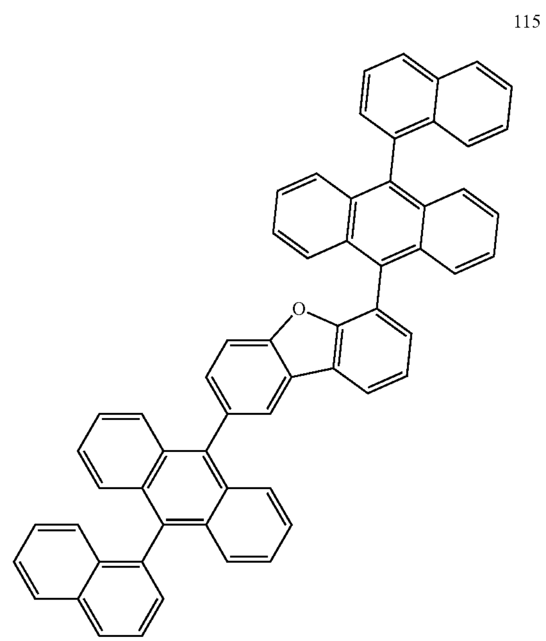

-continued
116
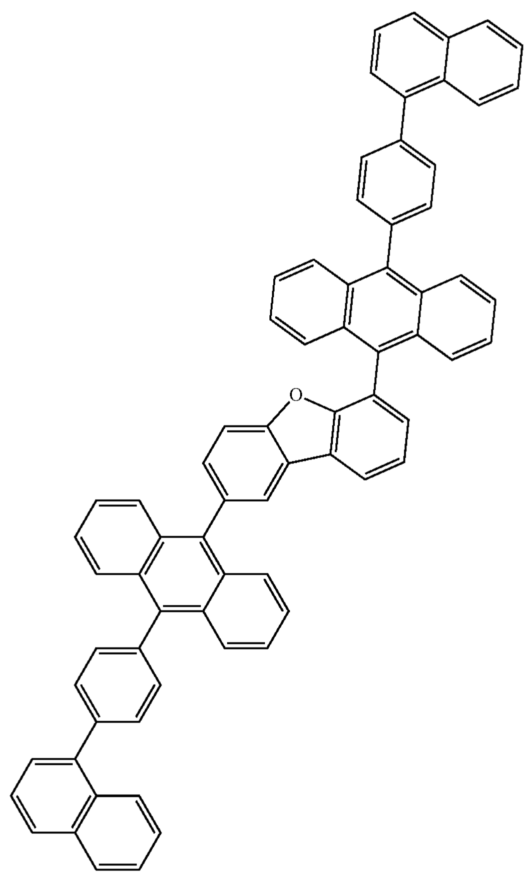
-continued
117
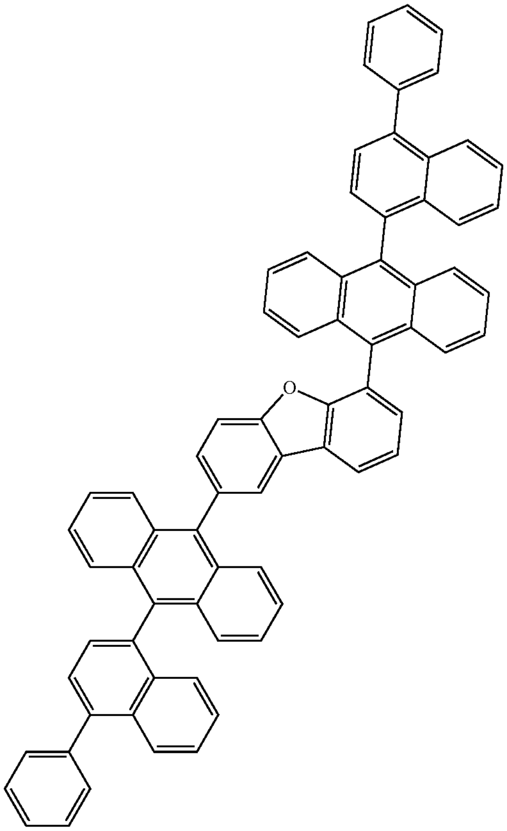
118
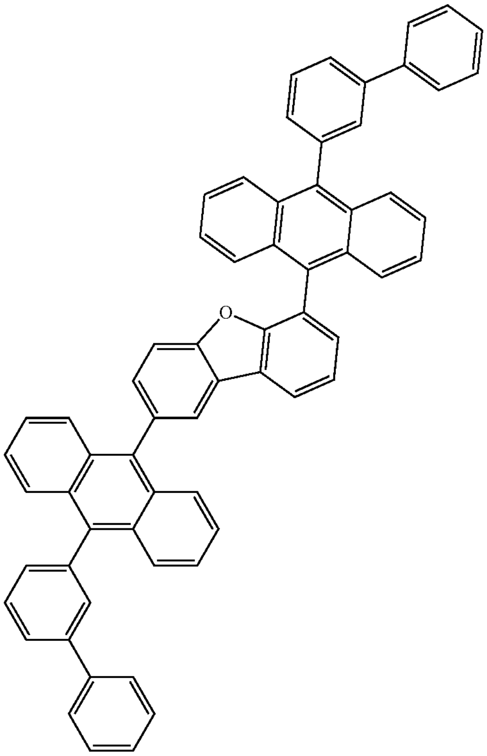

-continued
119
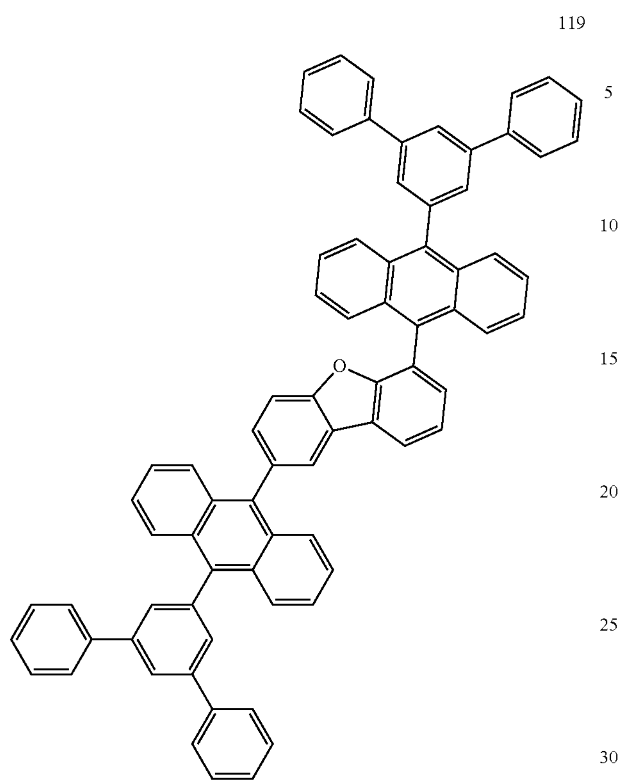
120
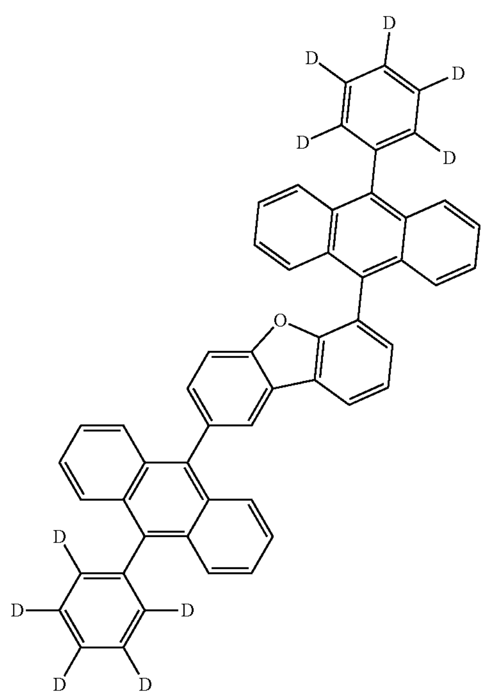
-continued
121
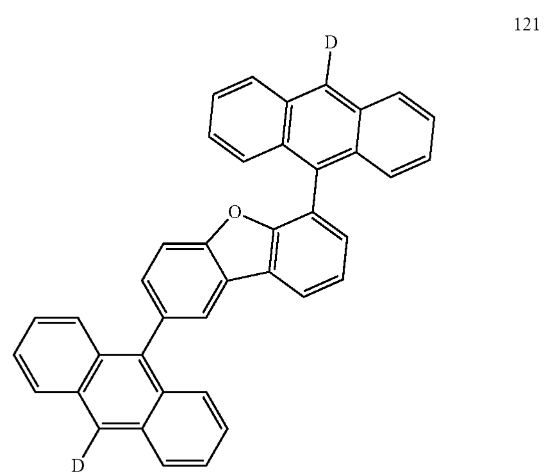
122
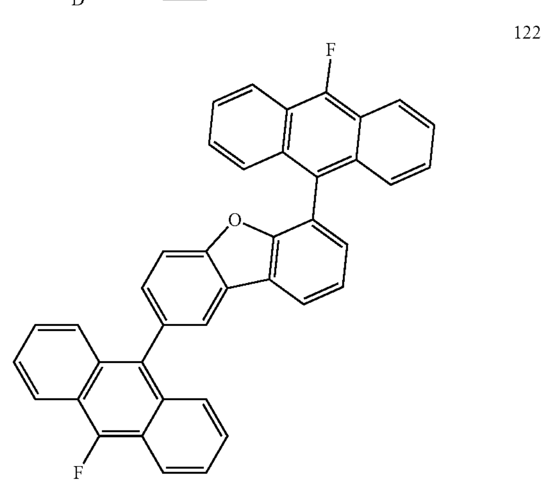
123
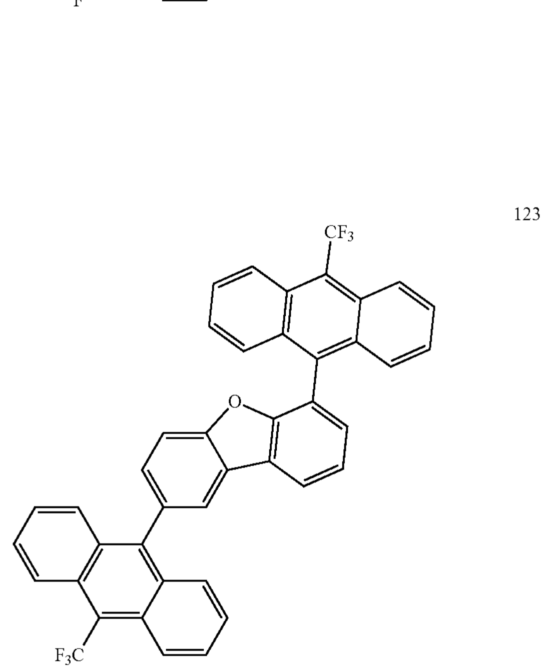

124
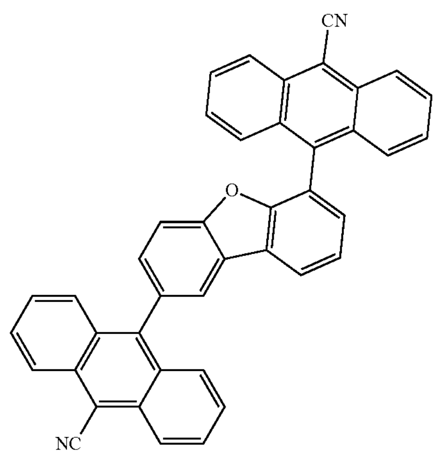
125
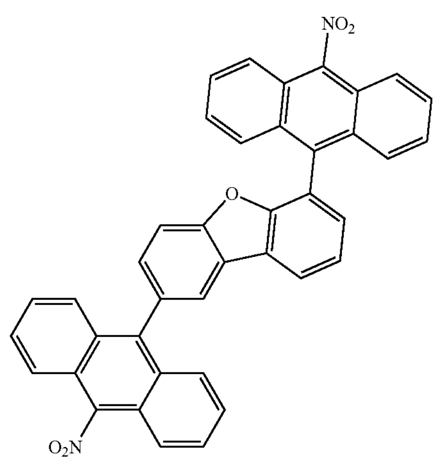
126
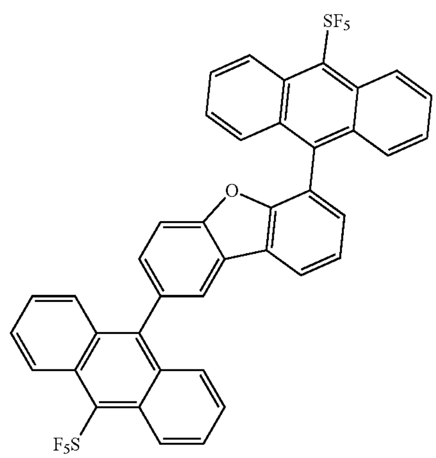
127
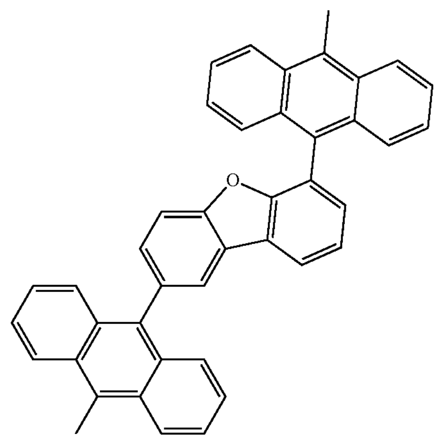
128
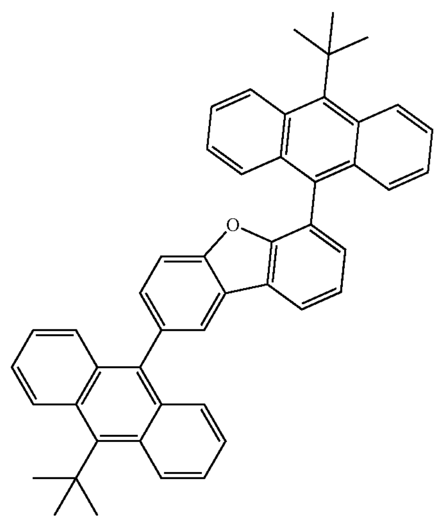
129
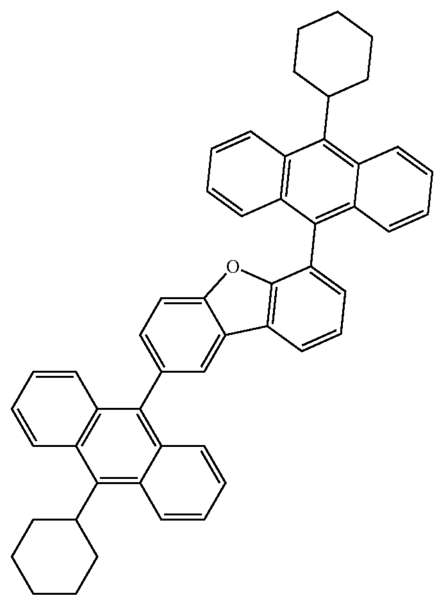

130
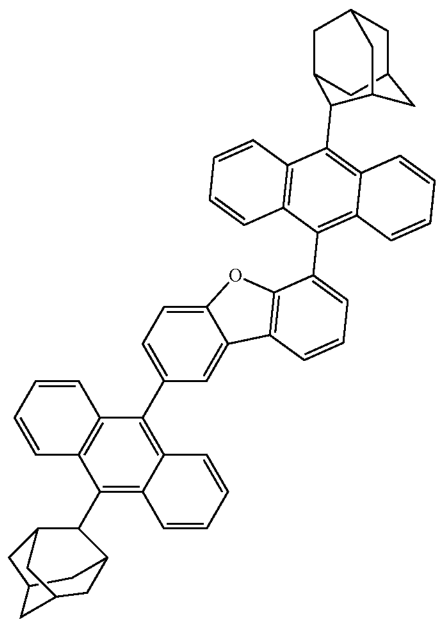
132
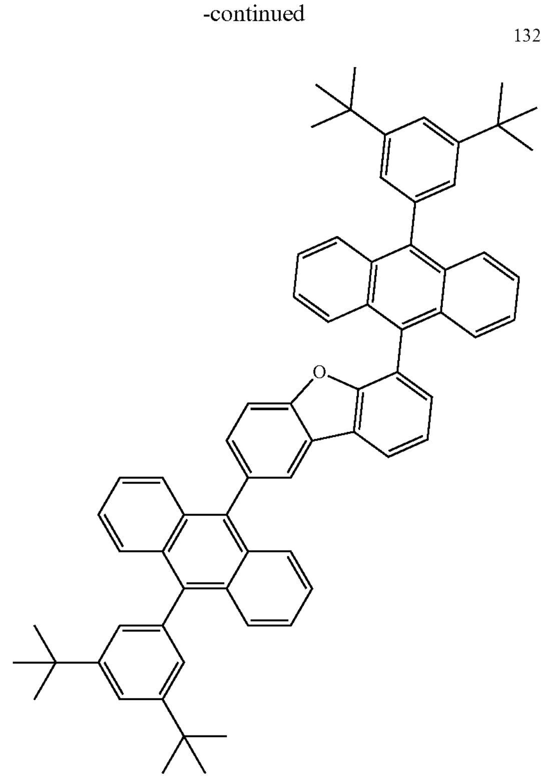
131
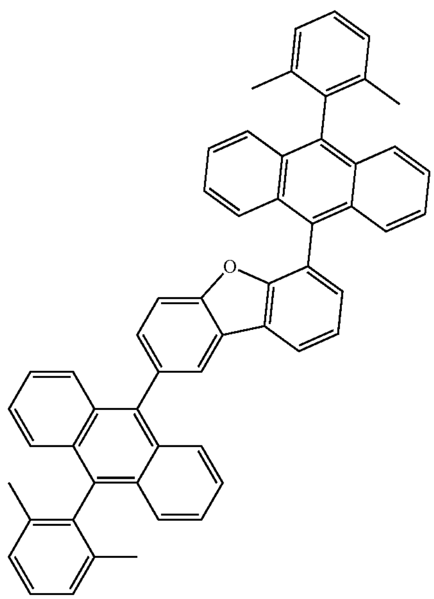
133
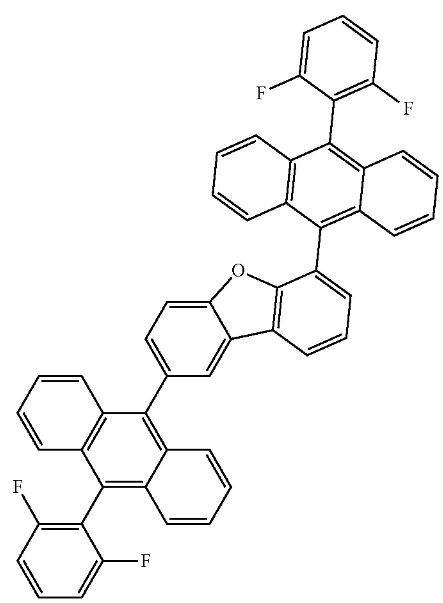

134
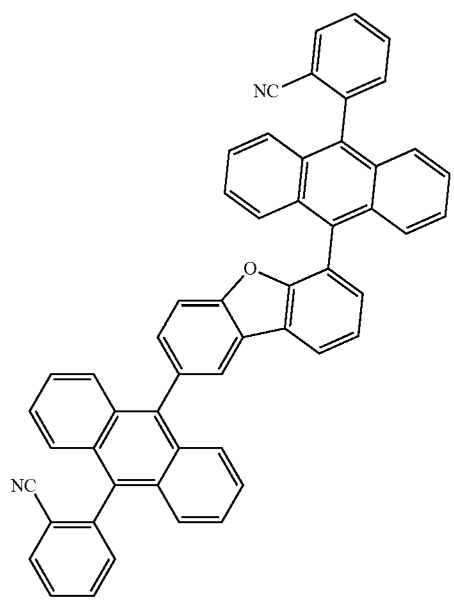
135
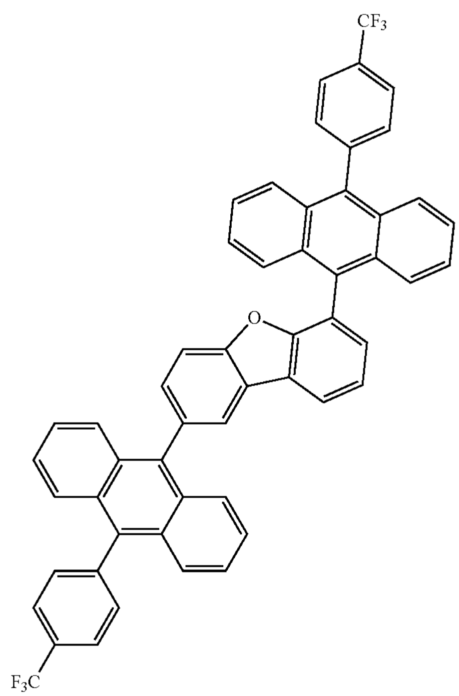
136
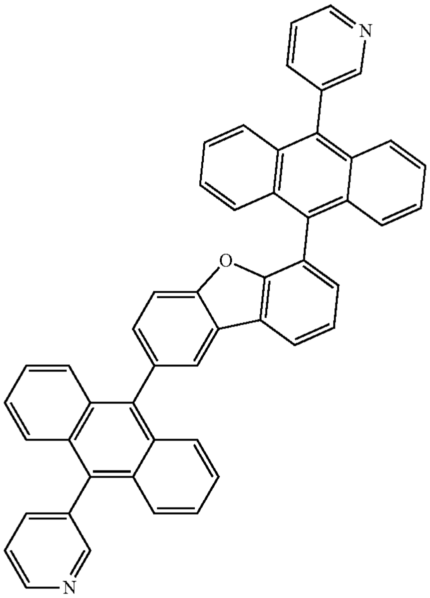
137
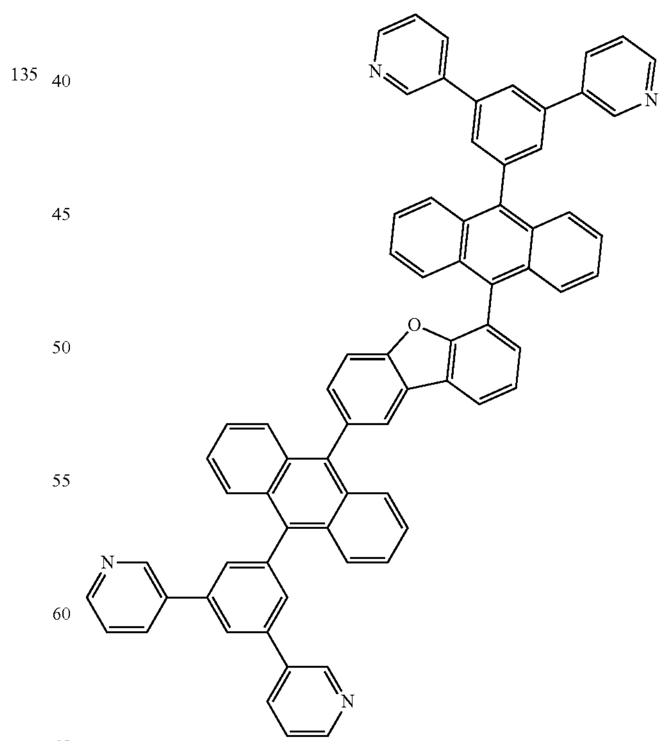

-continued
138
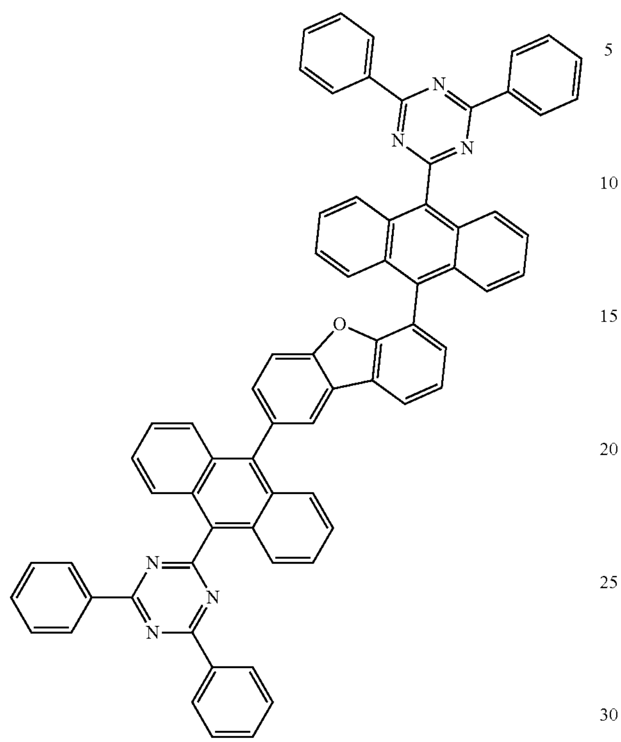
139
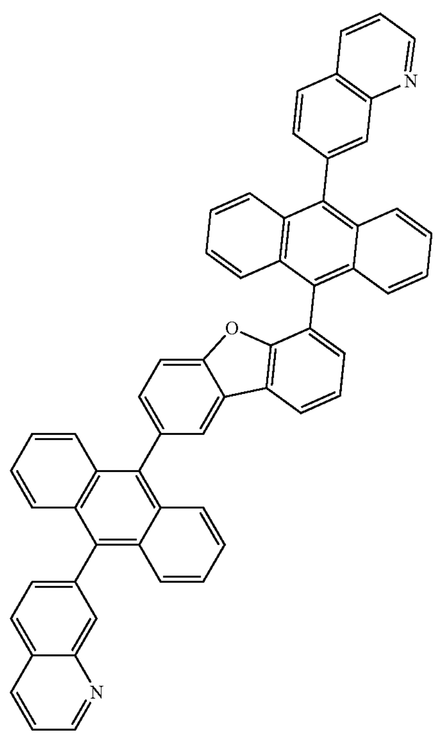
-continued
140
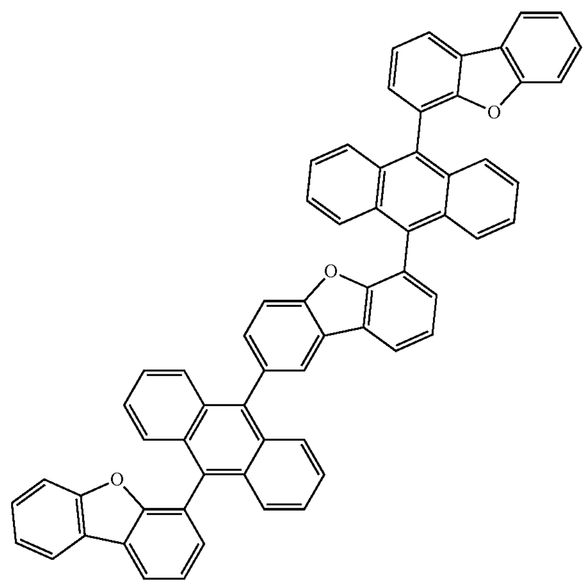
141
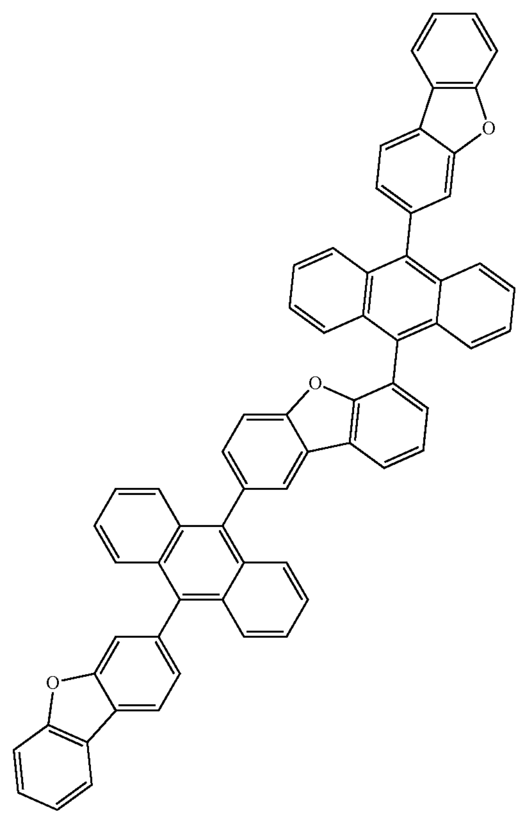

-continued
142
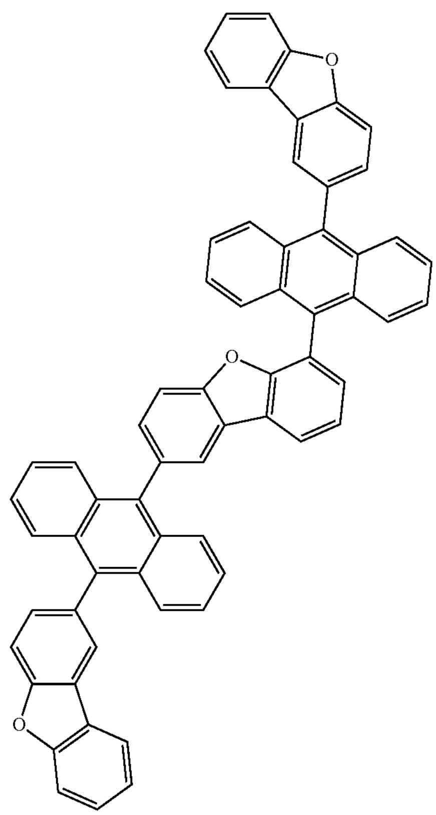
143
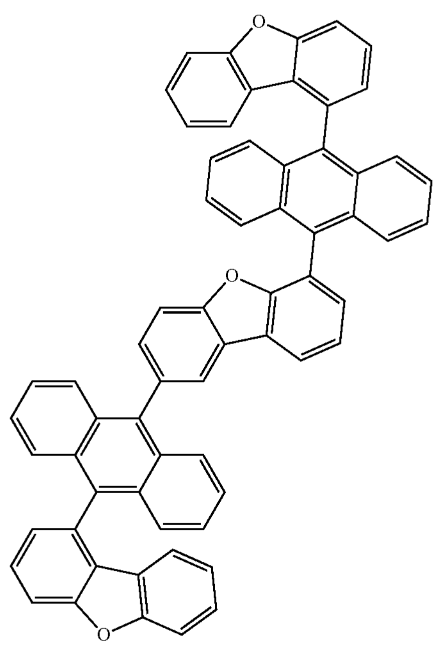
-continued
144
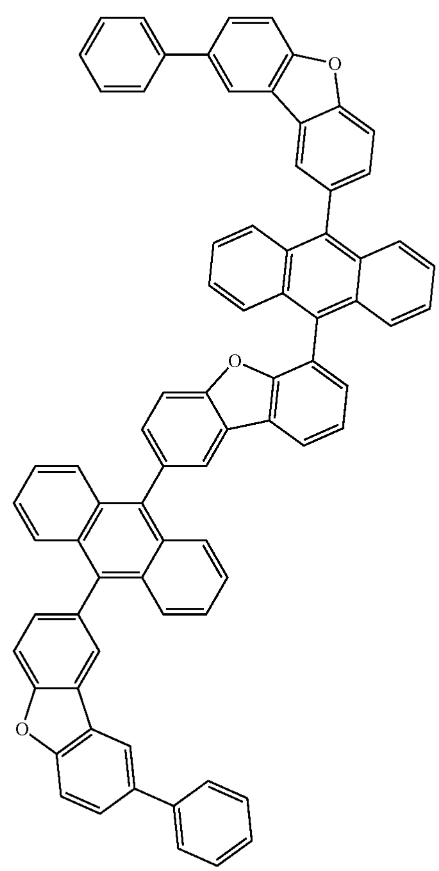

-continued
145
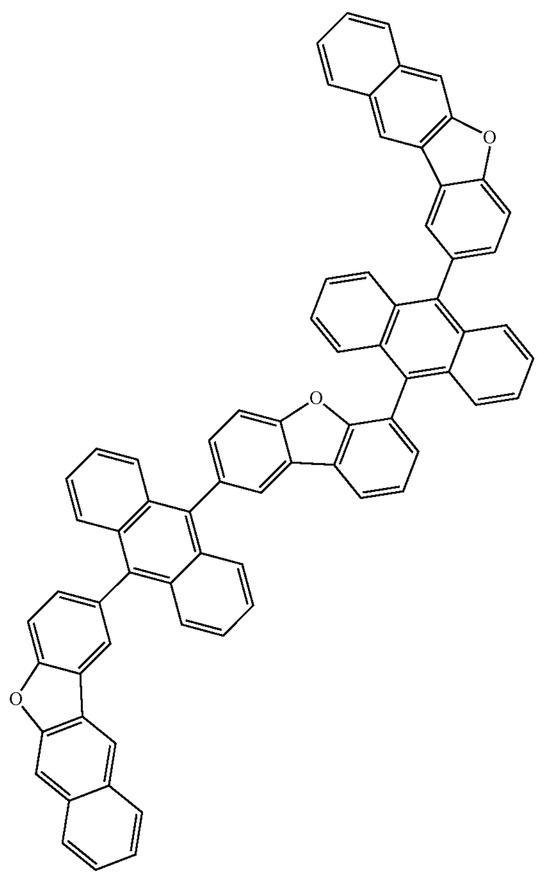
146
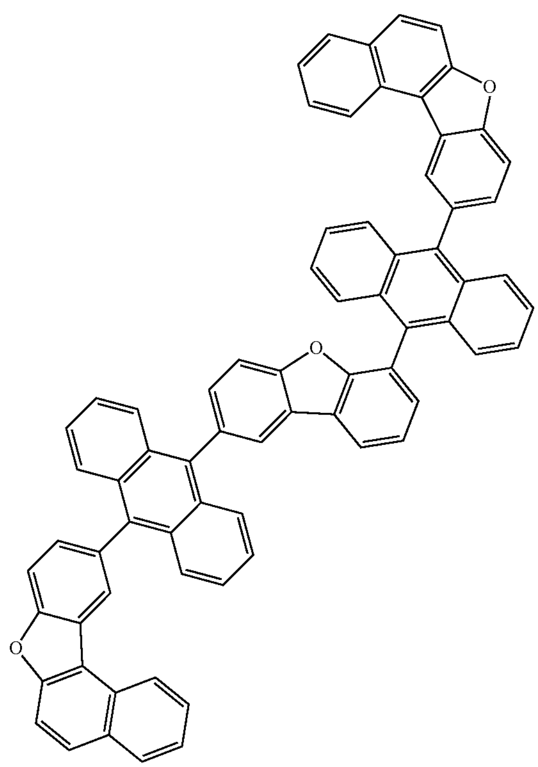
-continued
147
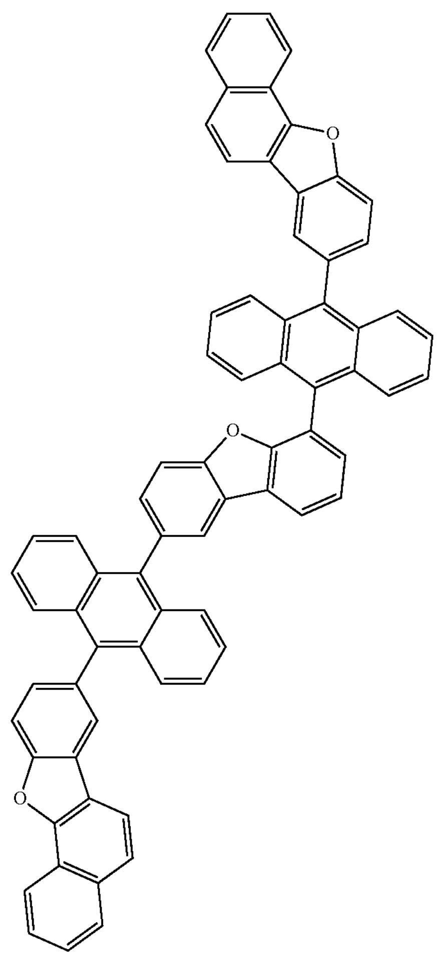
148
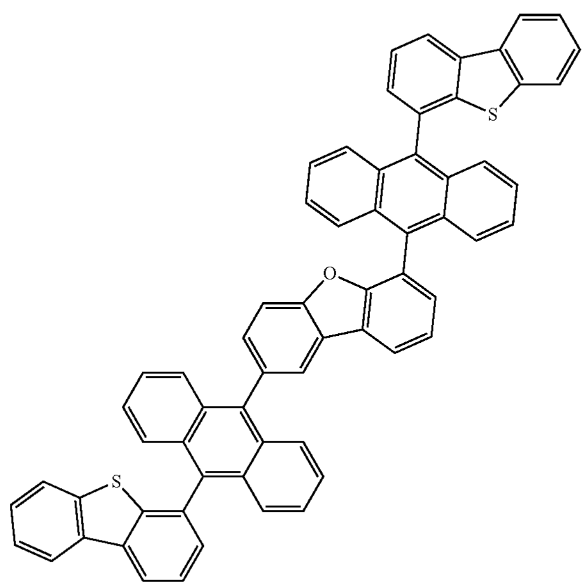

-continued
149
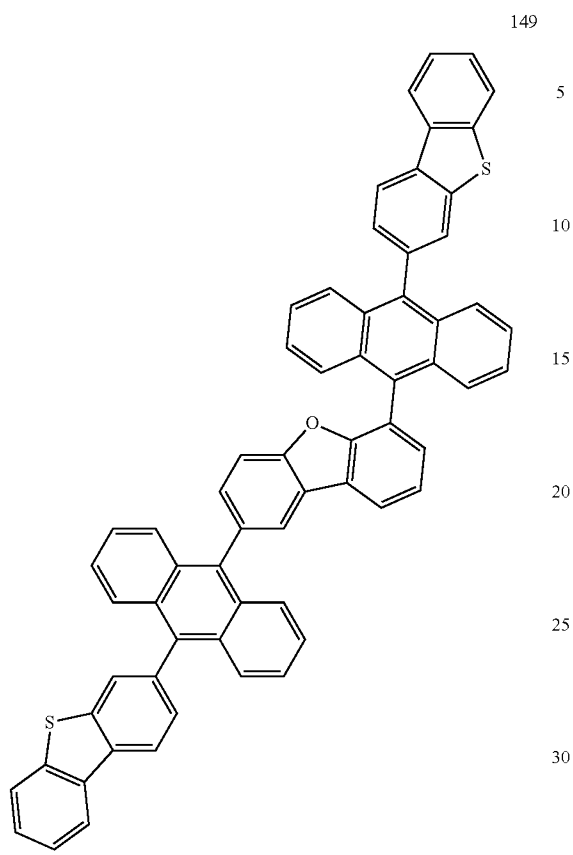
150
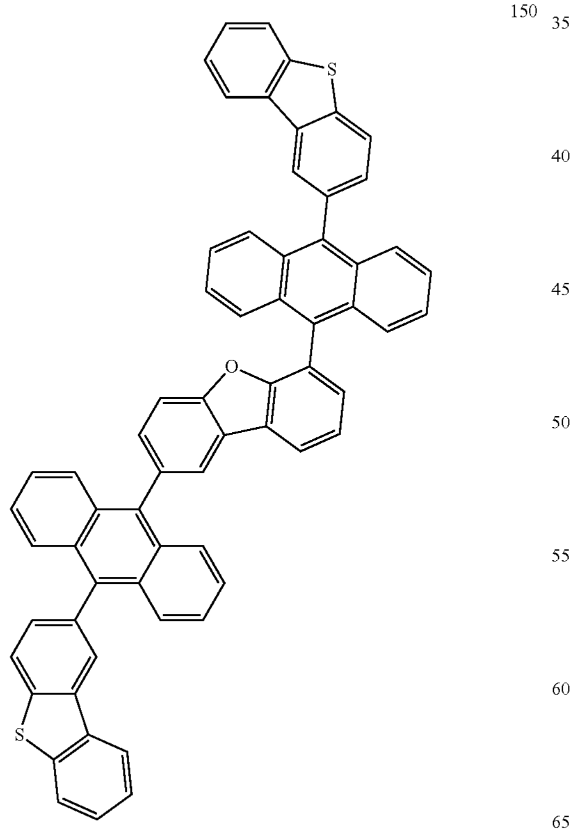
-continued
151
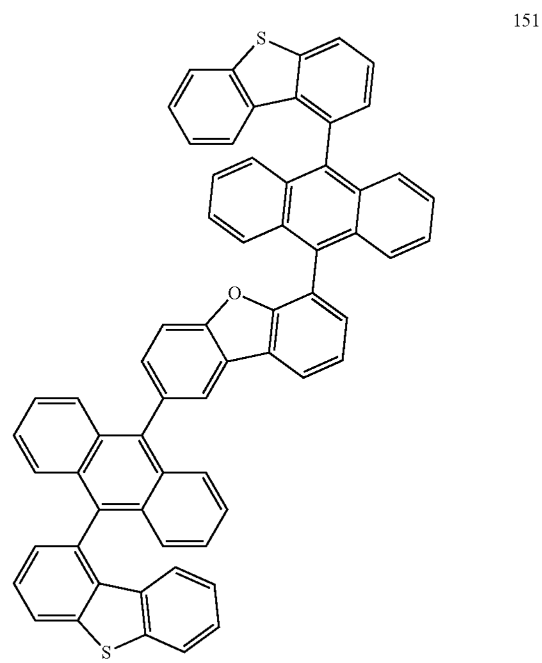
152
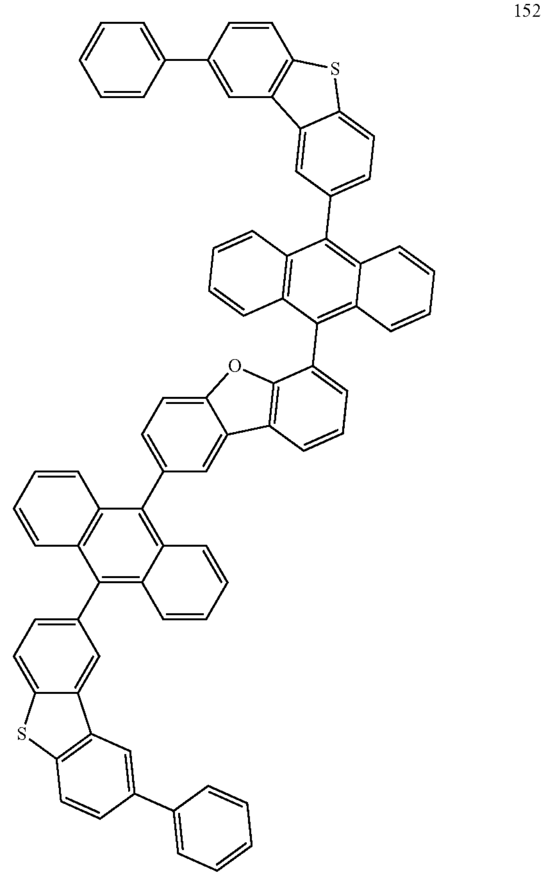

-continued
153
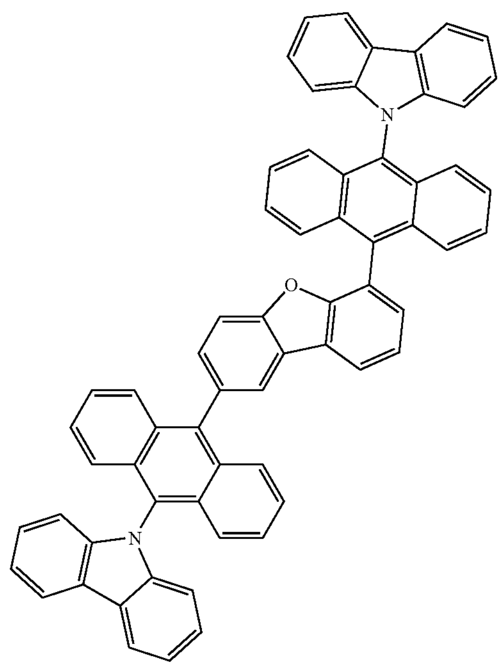
154
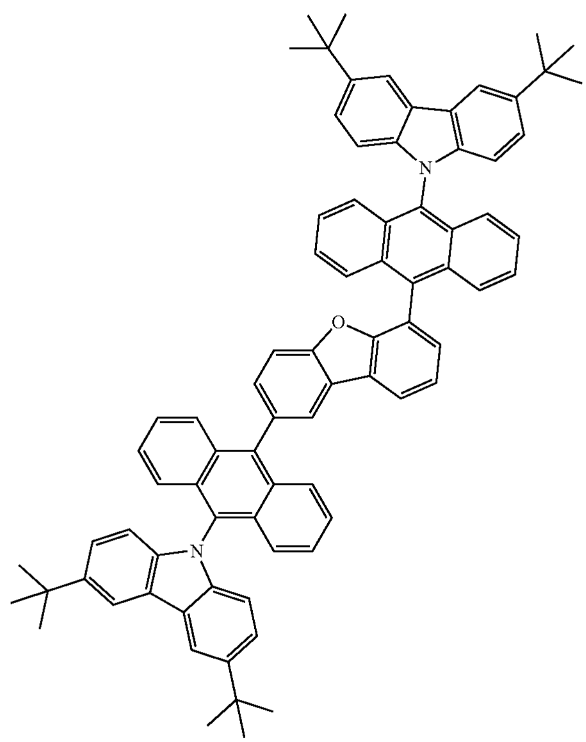
-continued
155
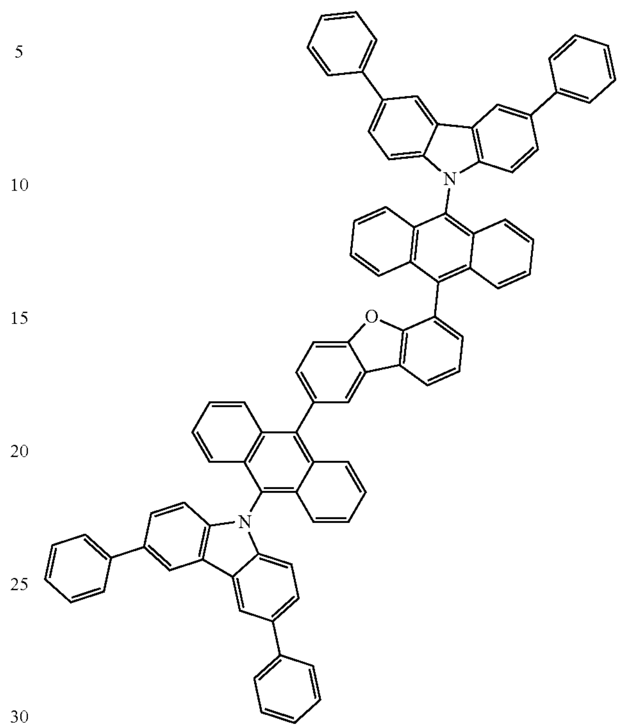
156
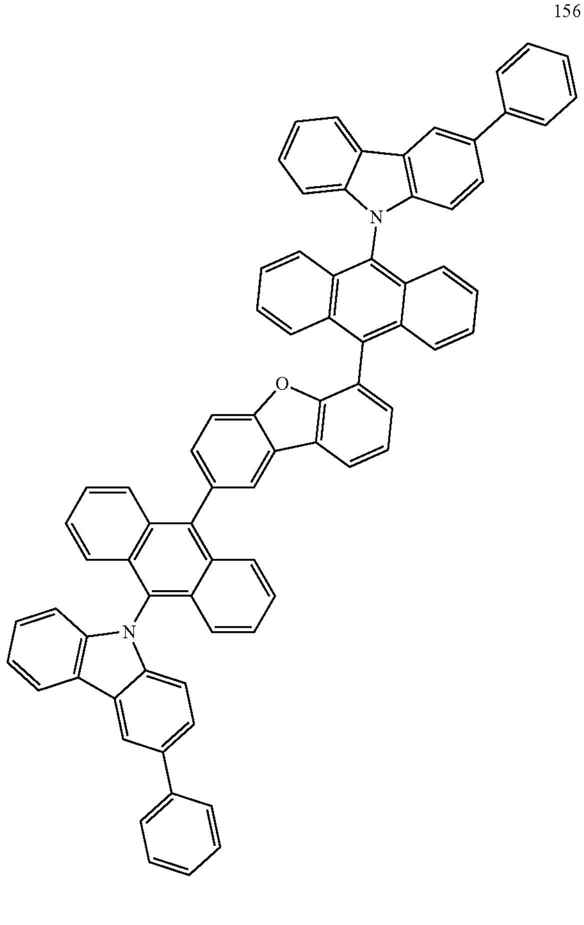

157
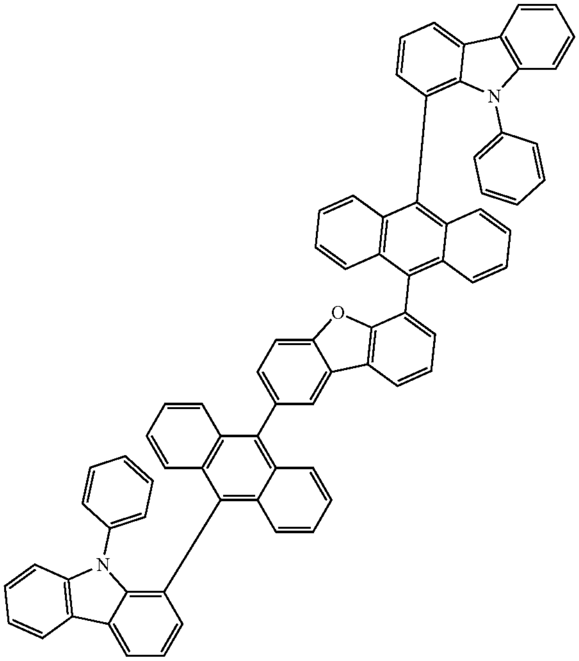
158
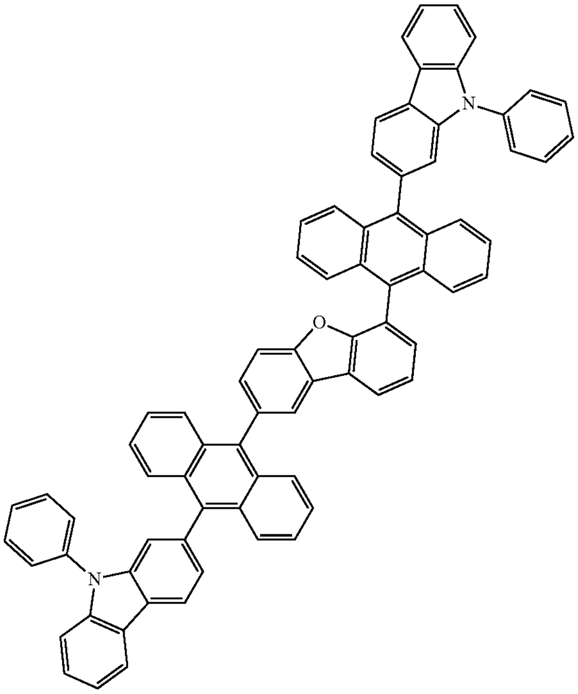
159
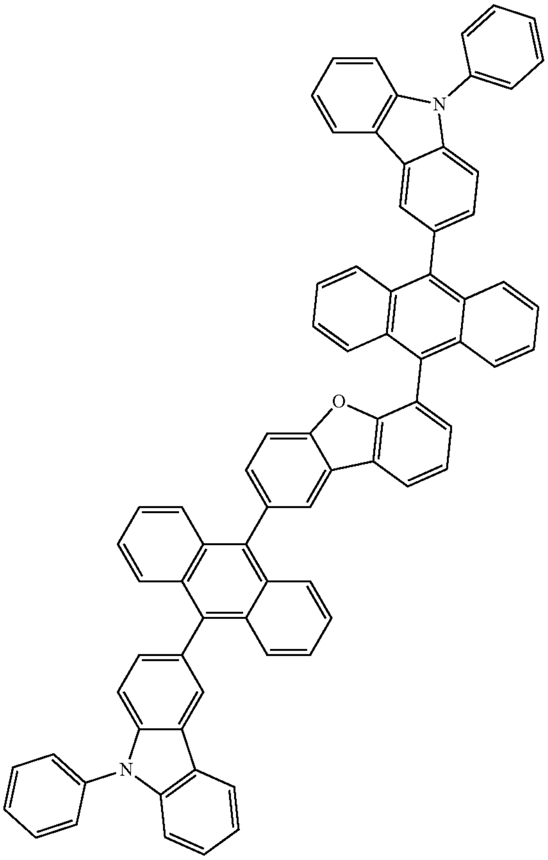

-continued
160
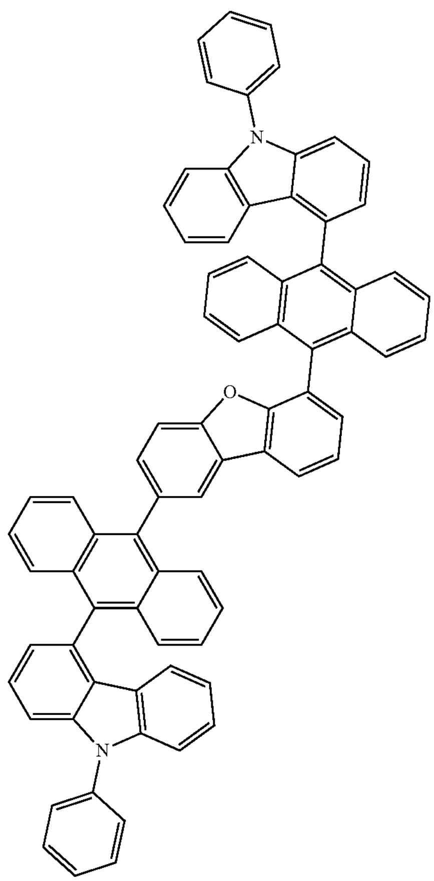
161
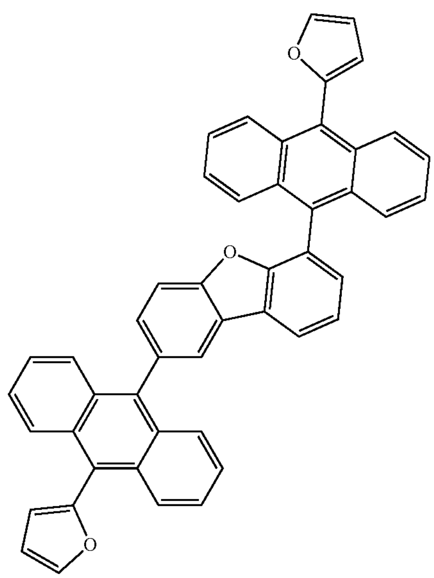
-continued
162
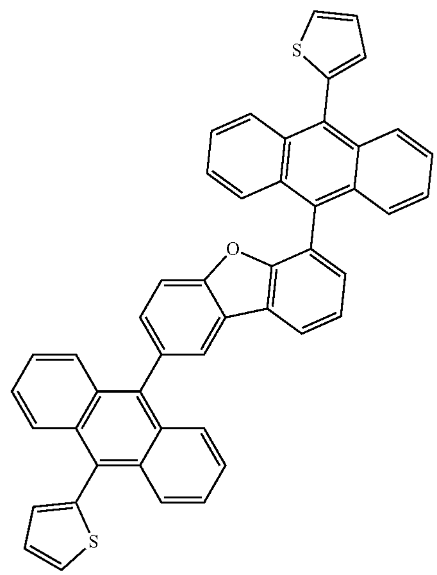
163
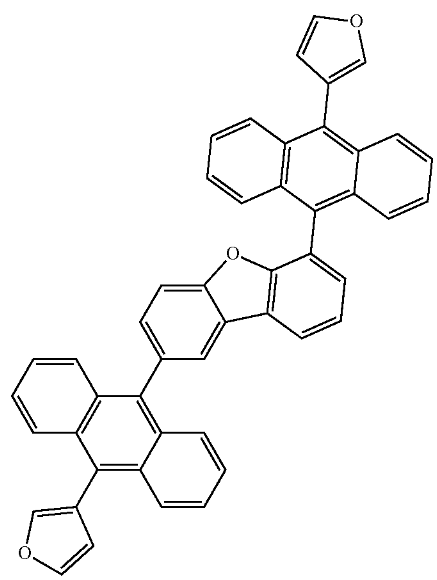

-continued
164
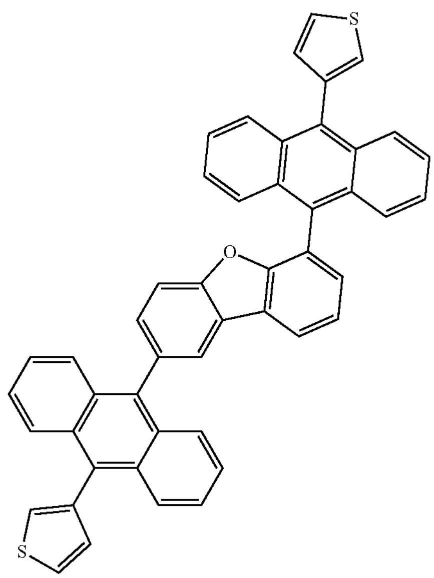
165
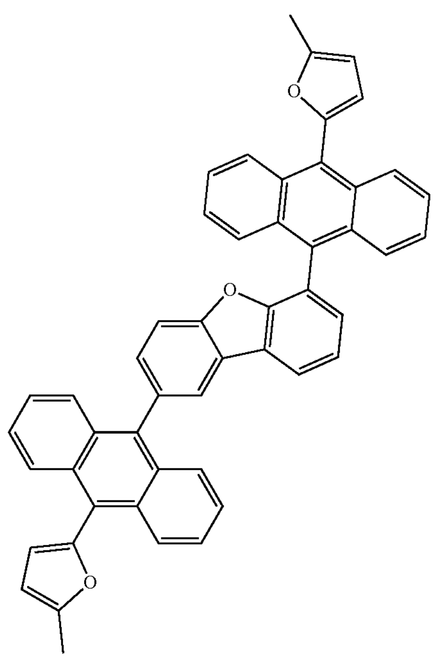
-continued
166
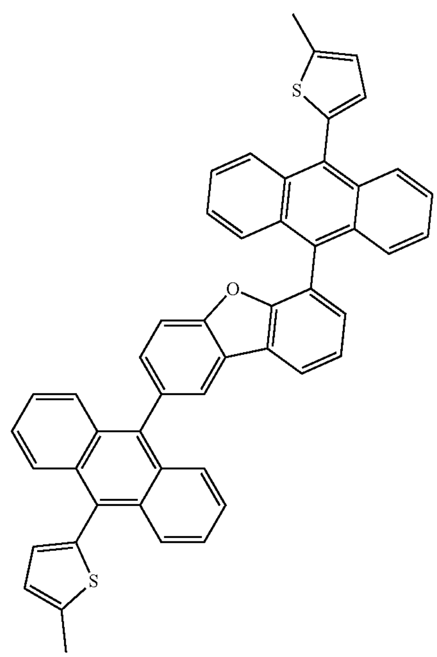
167
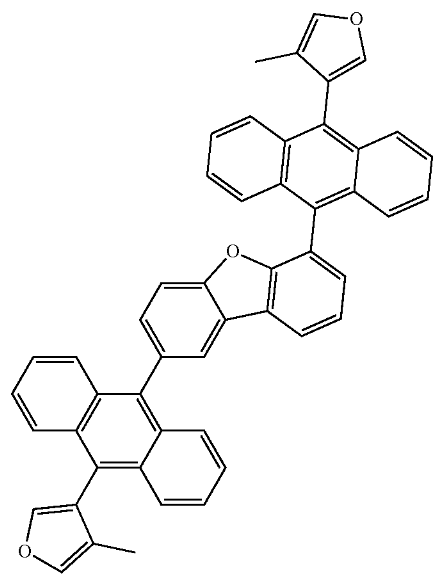

-continued
168
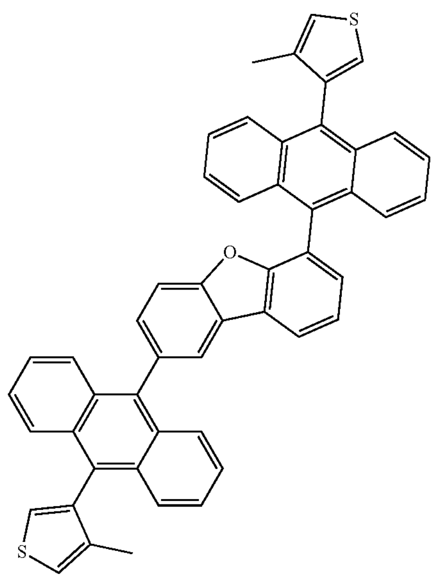
169
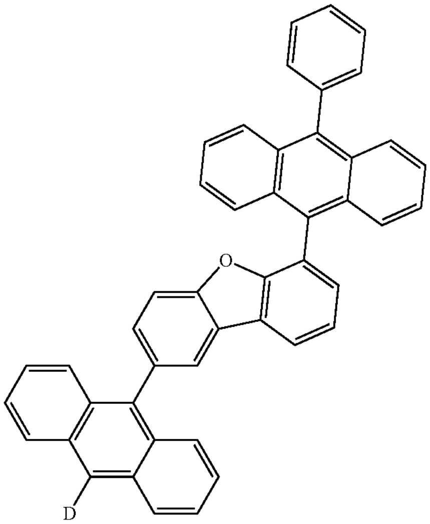
-continued
170
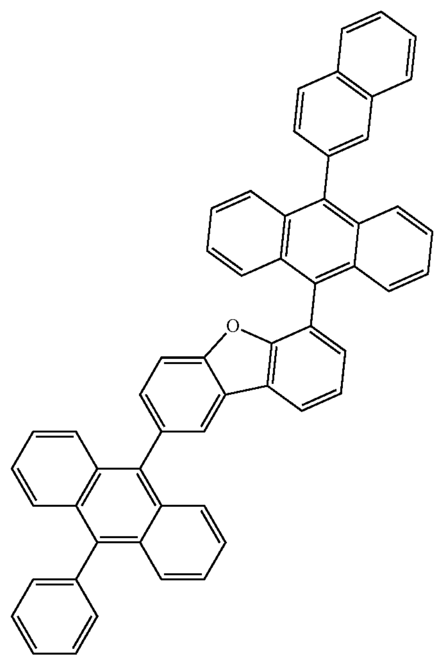
171
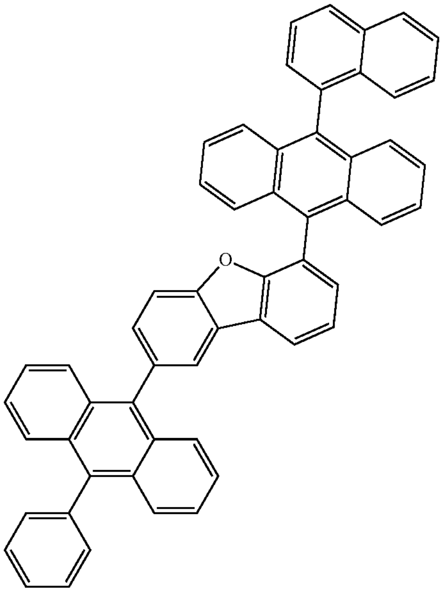

-continued
172
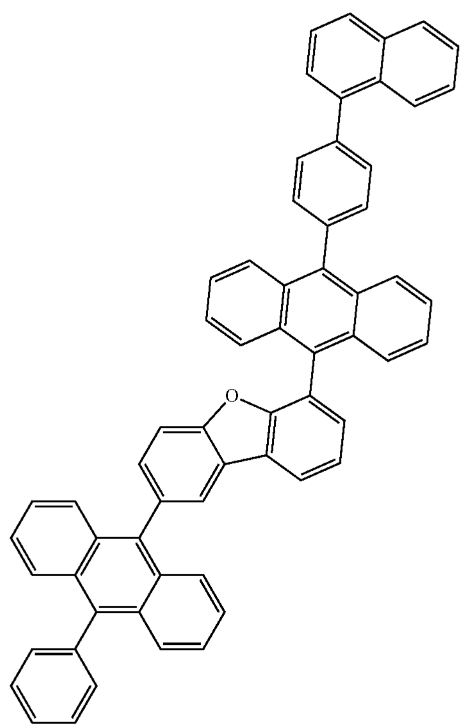
173
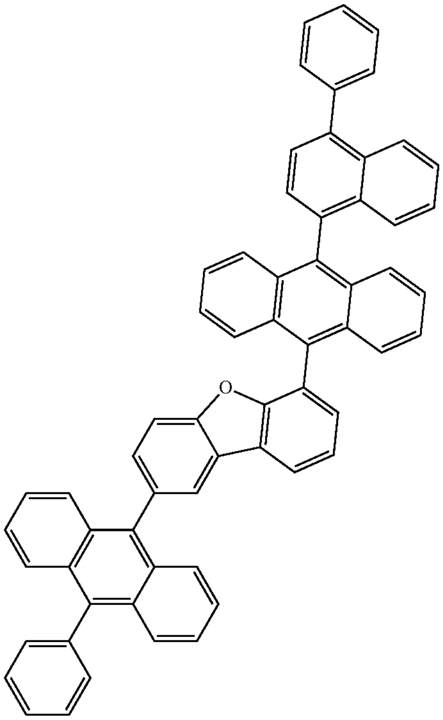
-continued
174
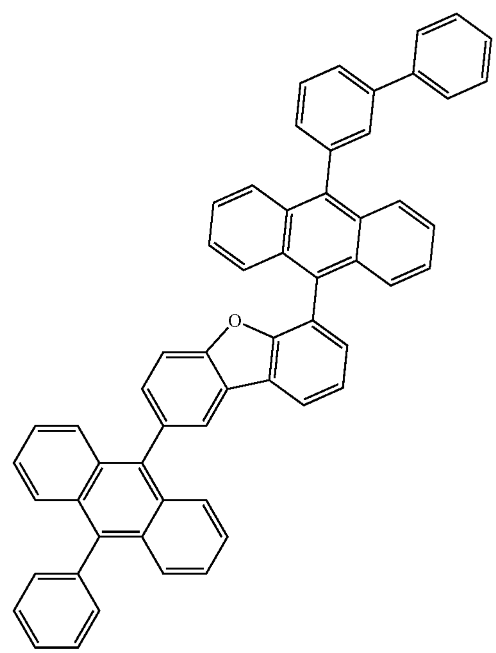
175
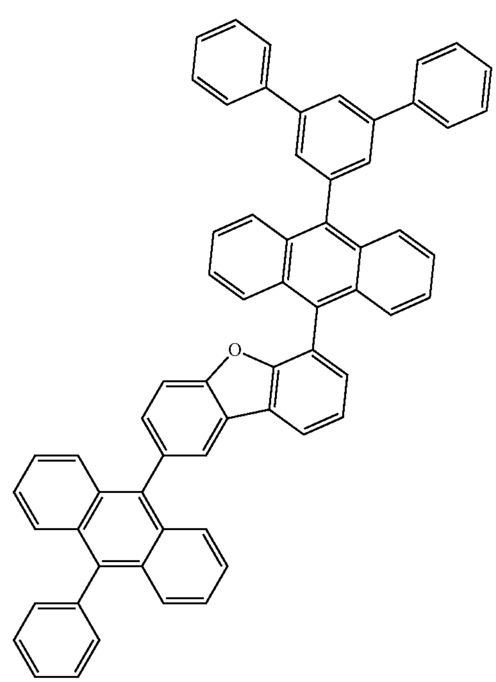

-continued
176
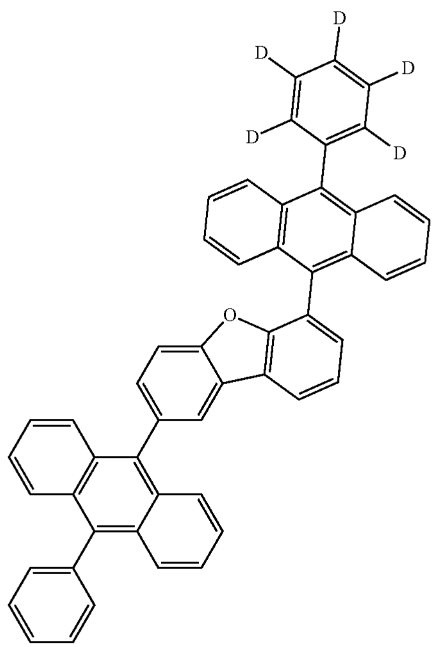
177
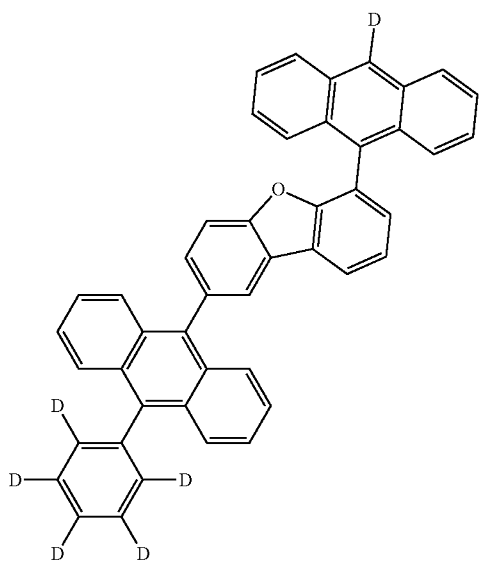
-continued
178
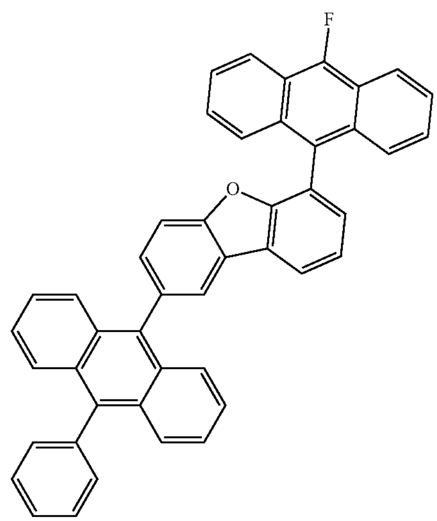
179
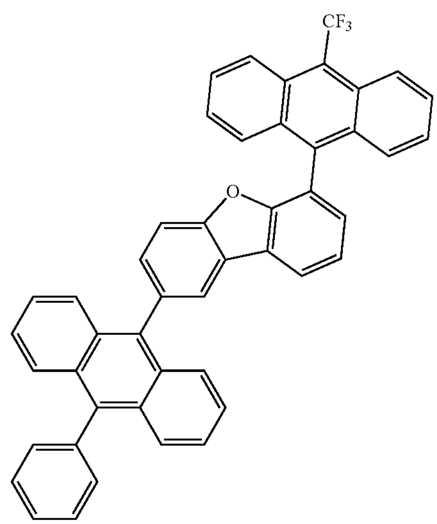
180
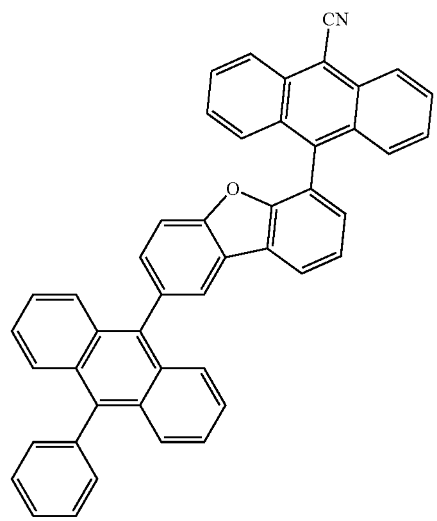

-continued
181
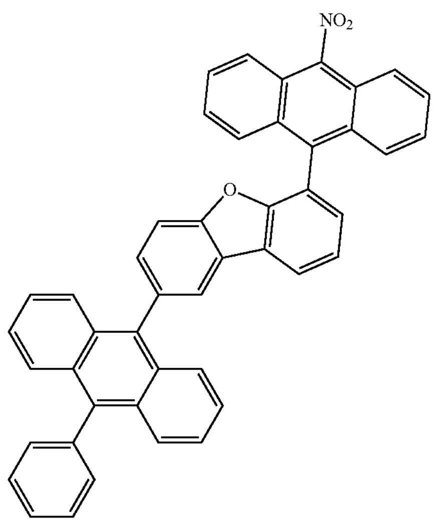
182
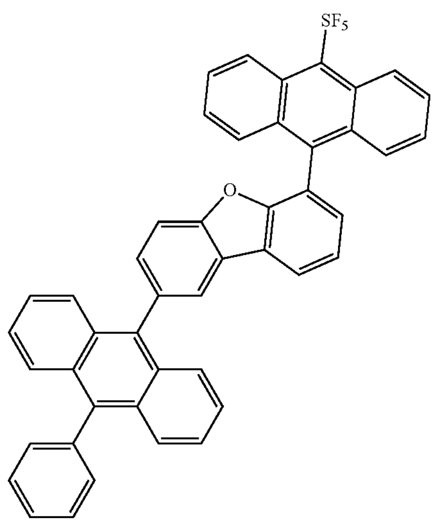
183
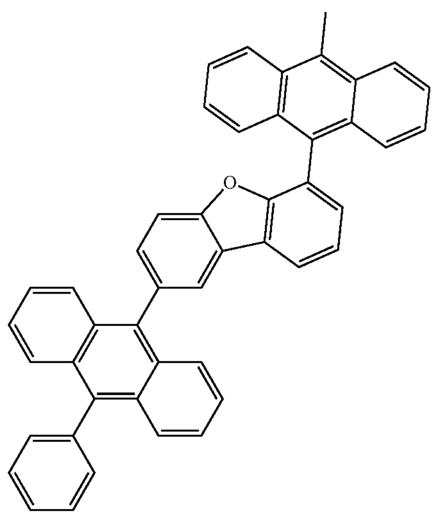
-continued
184
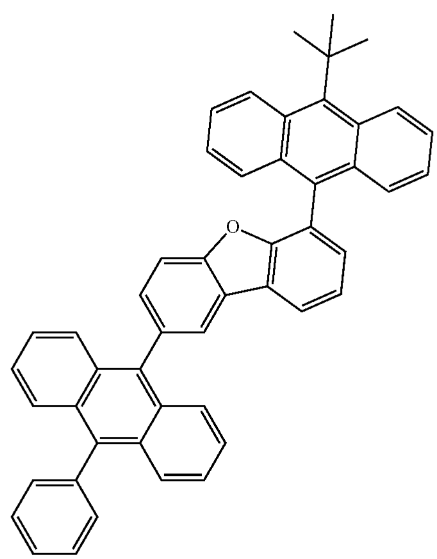
185
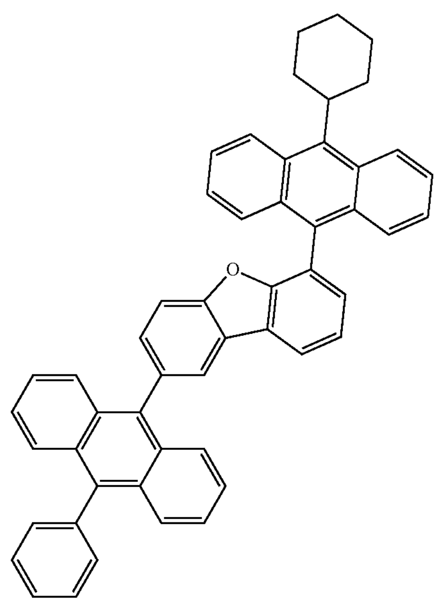

-continued
186
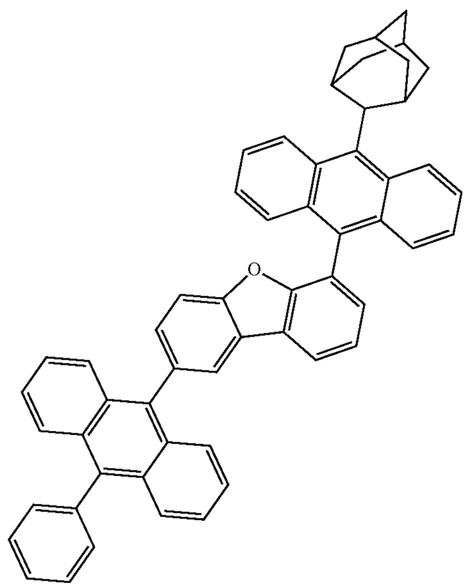
187
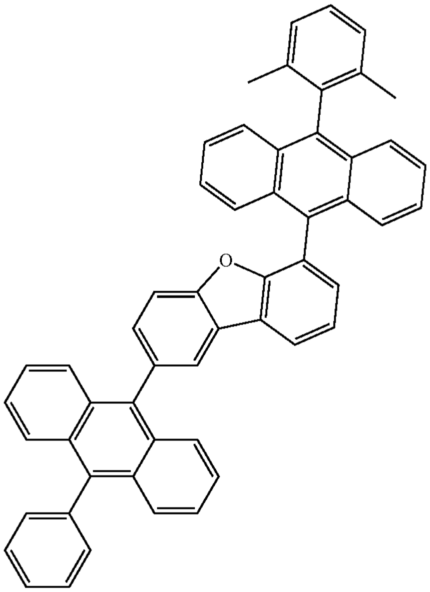
-continued
188
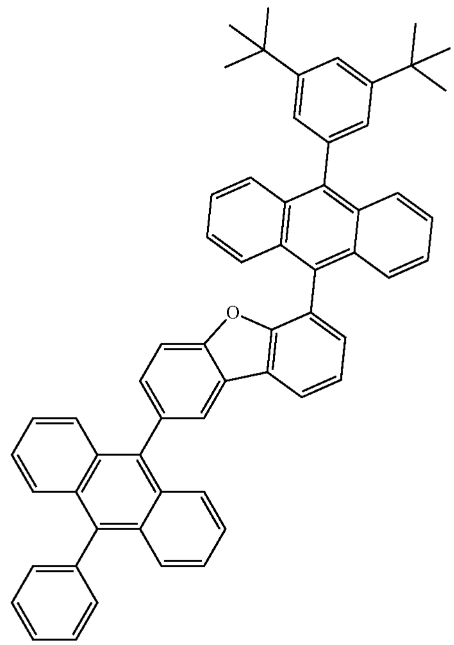
189
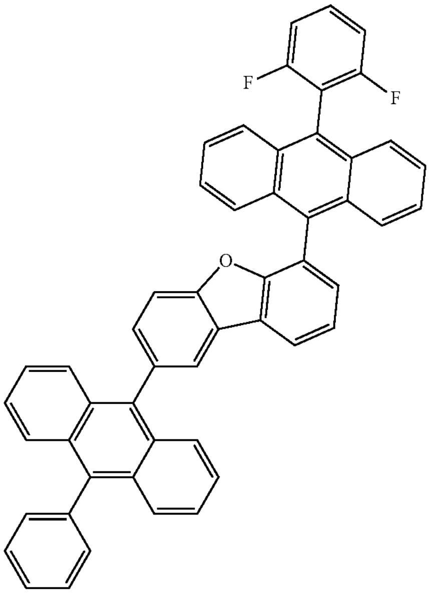

-continued
190
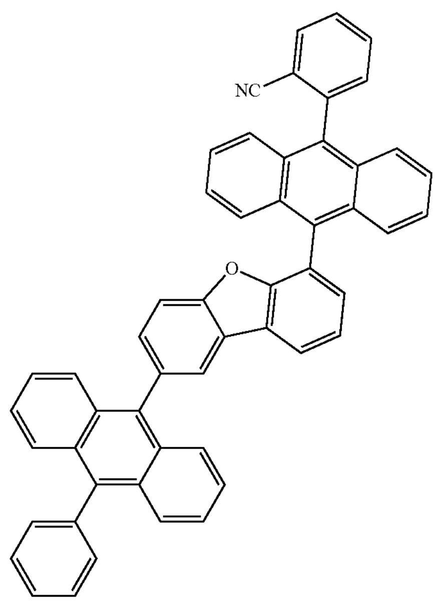
191
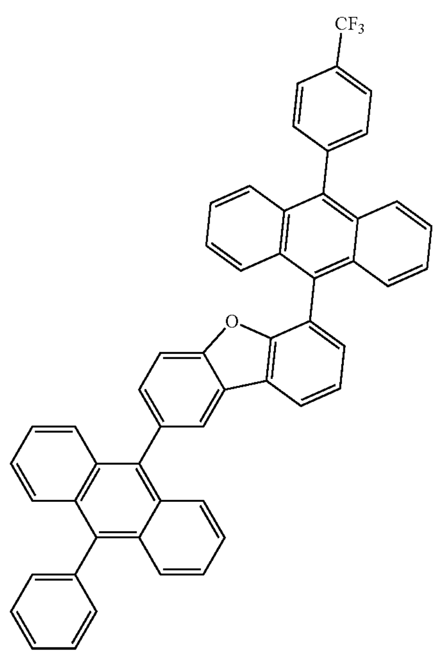
-continued
192
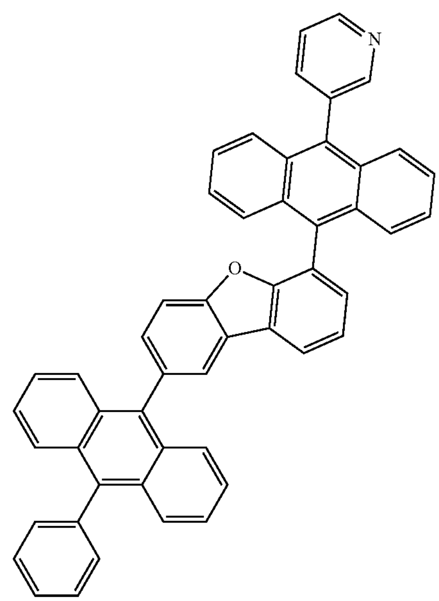
193
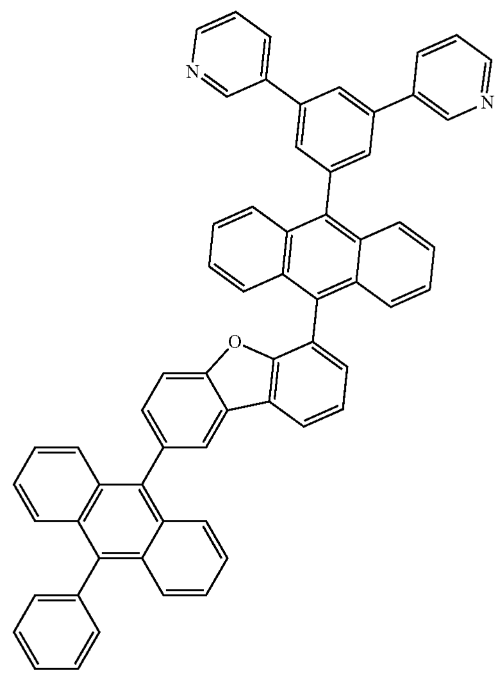

-continued
194
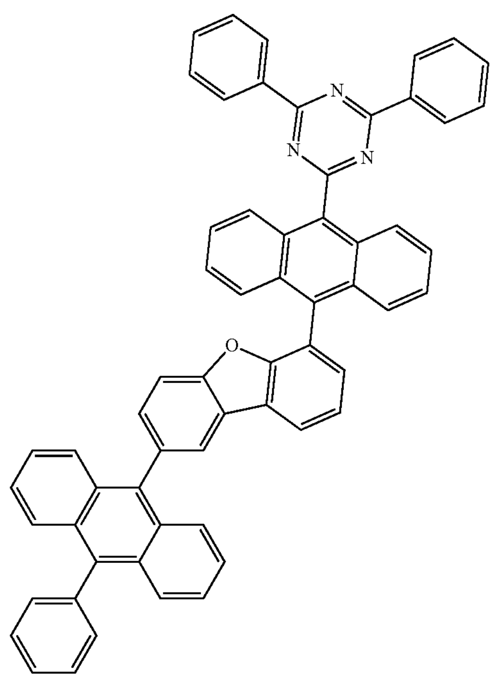
195
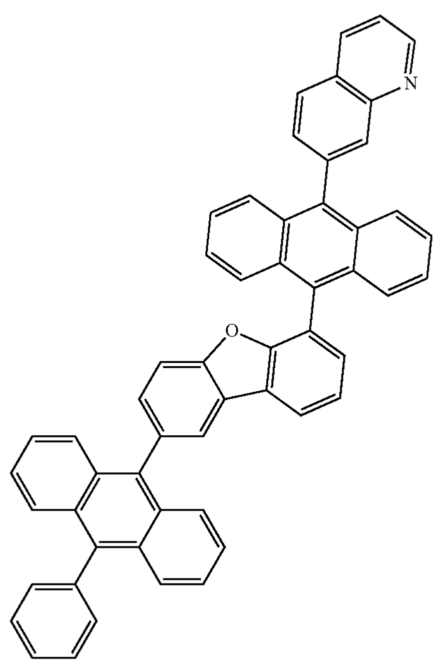
-continued
196
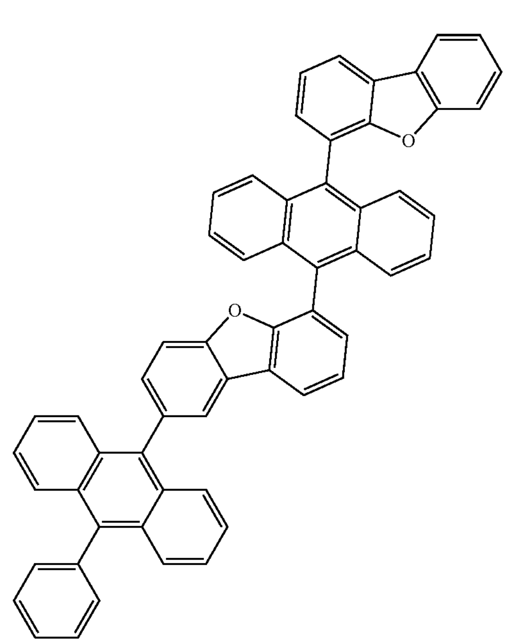
197
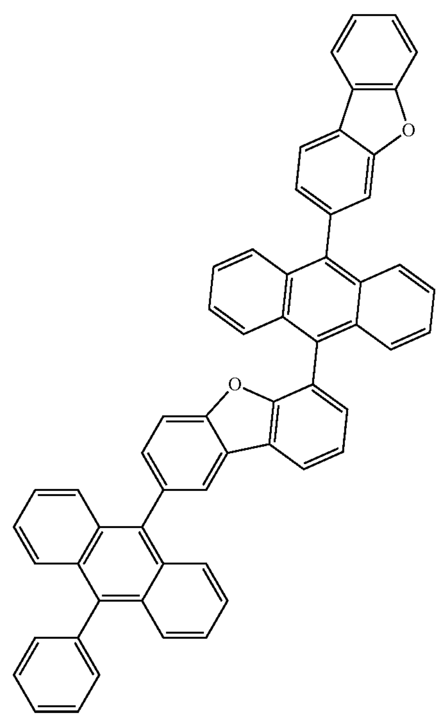

-continued
198
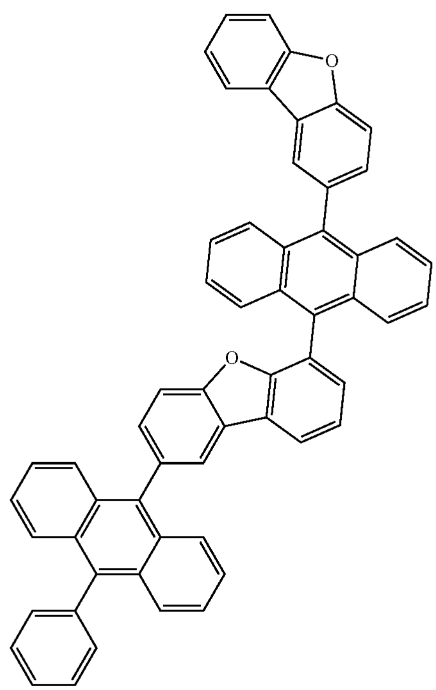
199
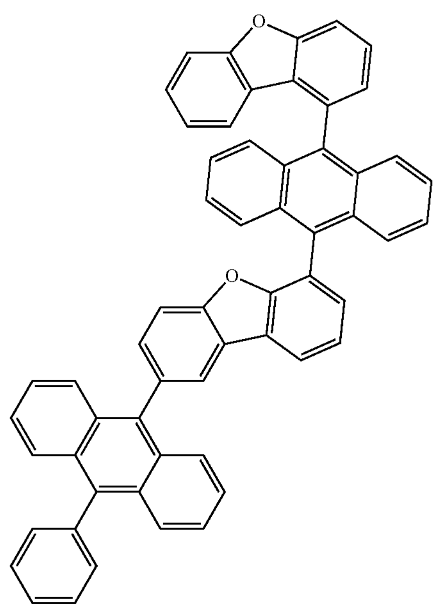
-continued
200
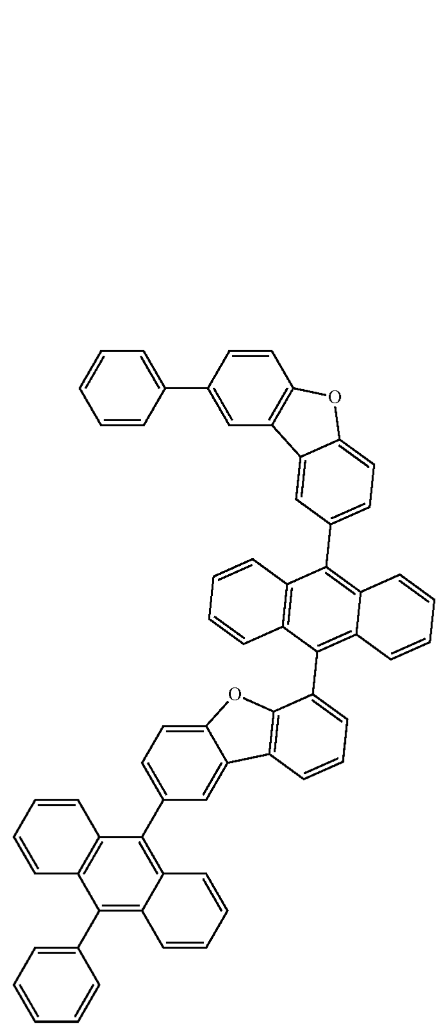

201
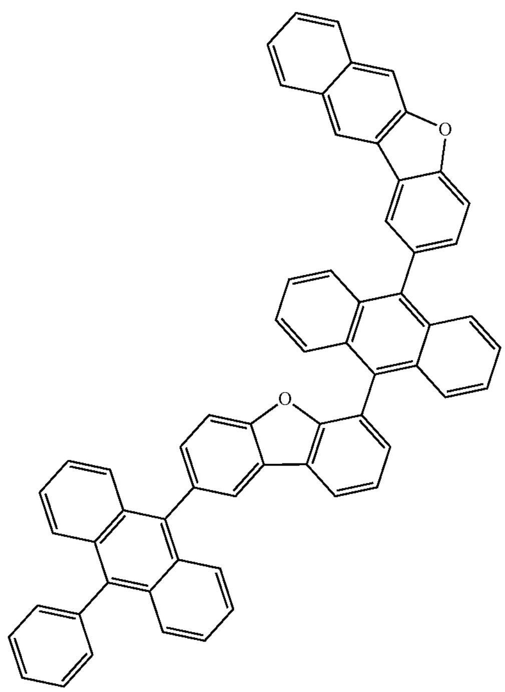
202
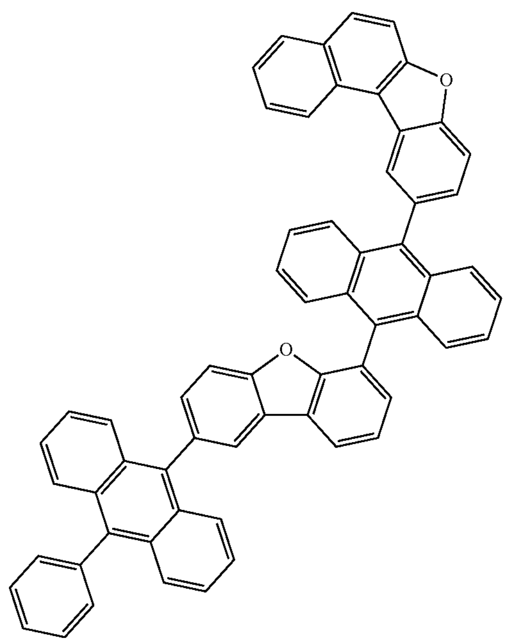
203
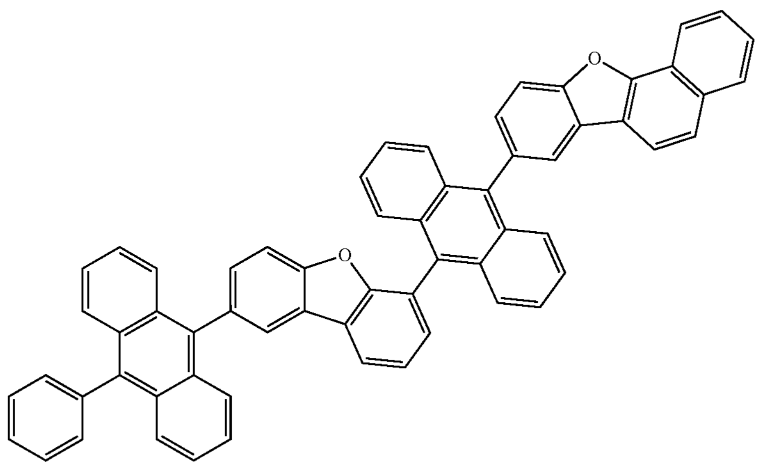

-continued
204
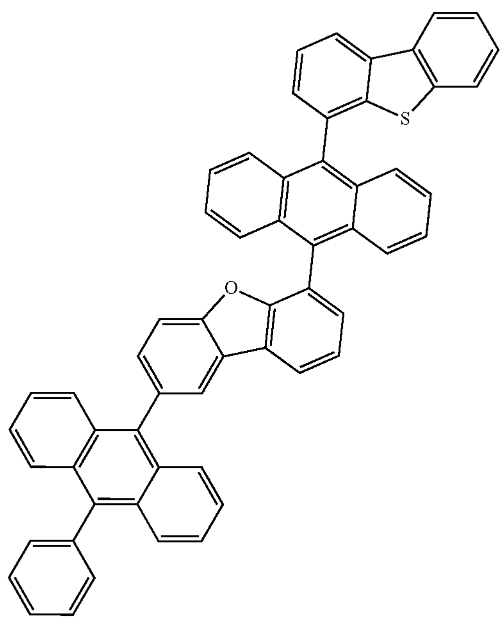
205
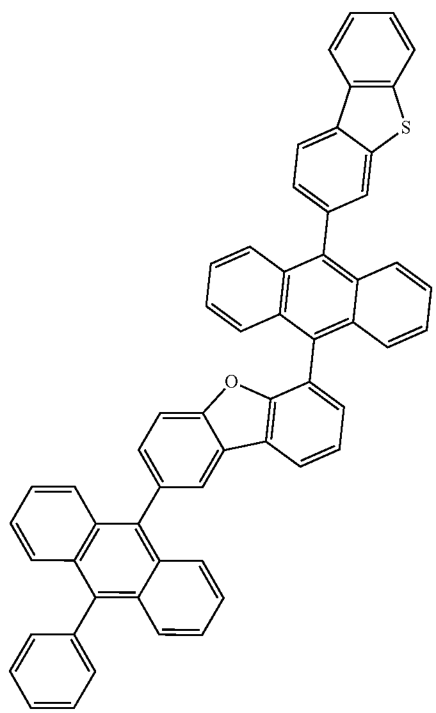
206
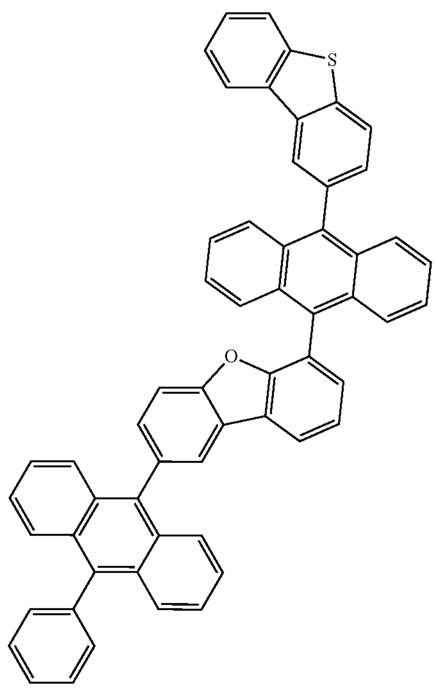
207
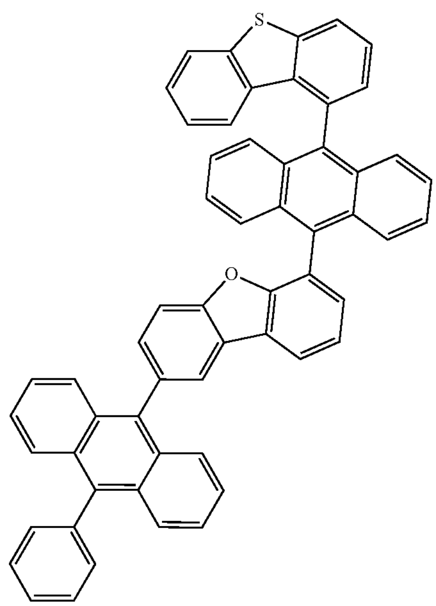

-continued
208
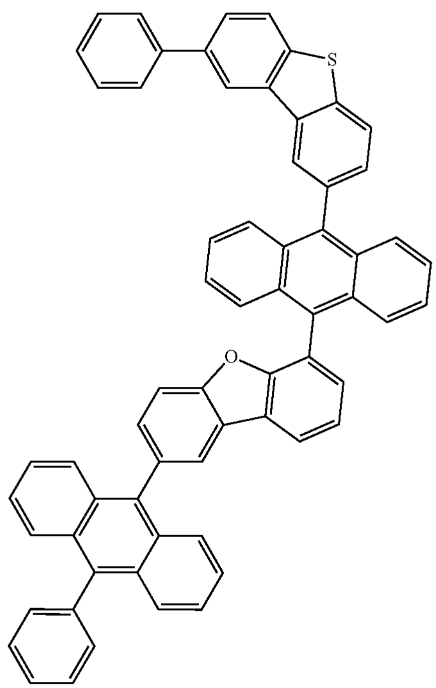
209
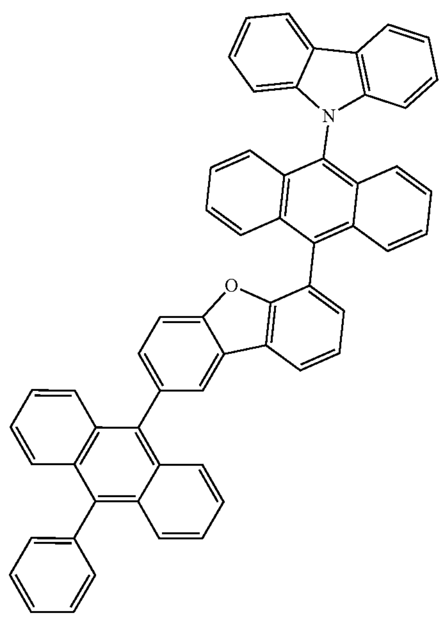
210
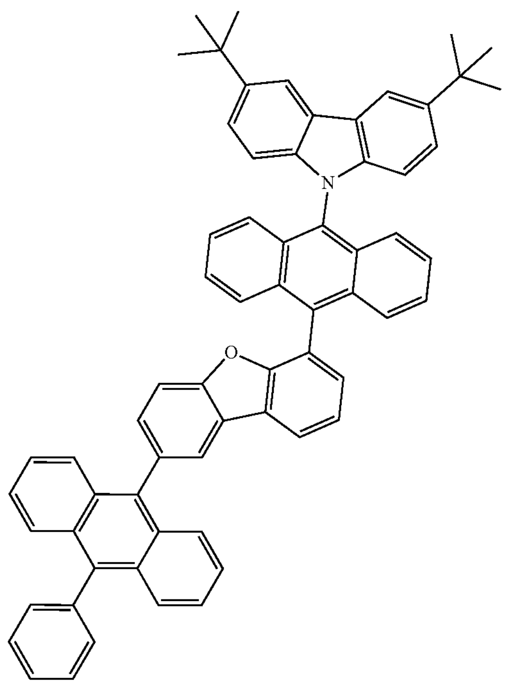
211
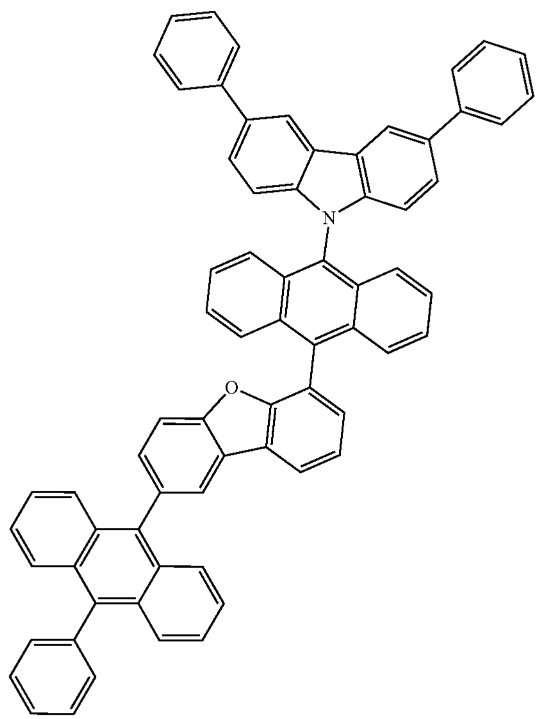

-continued
212
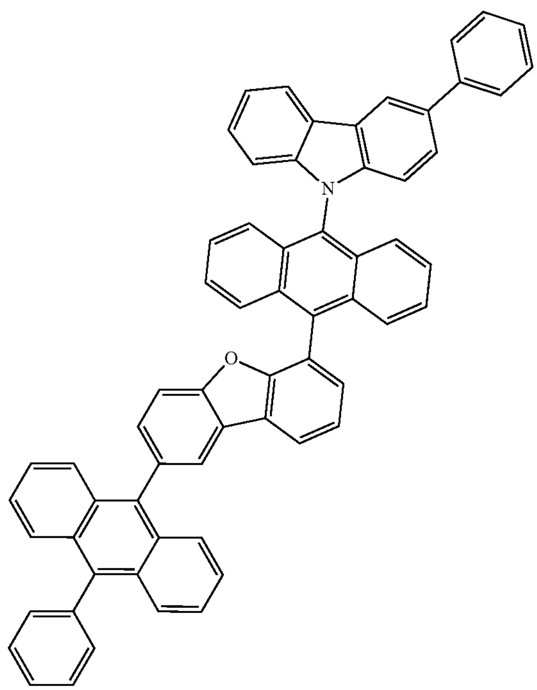
213
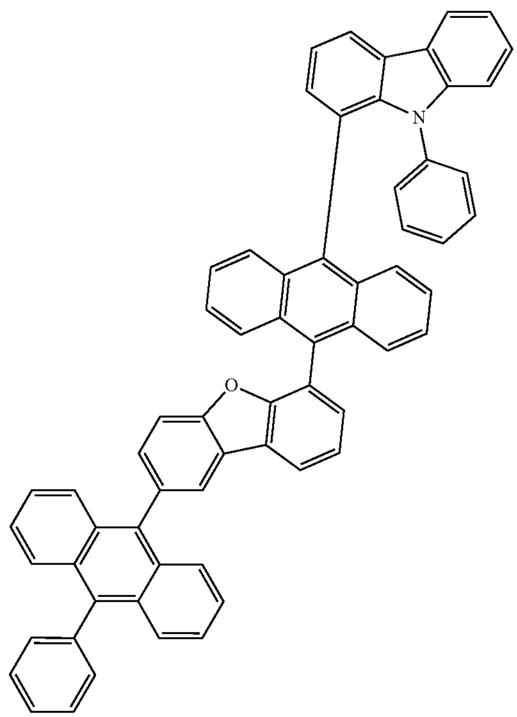
214
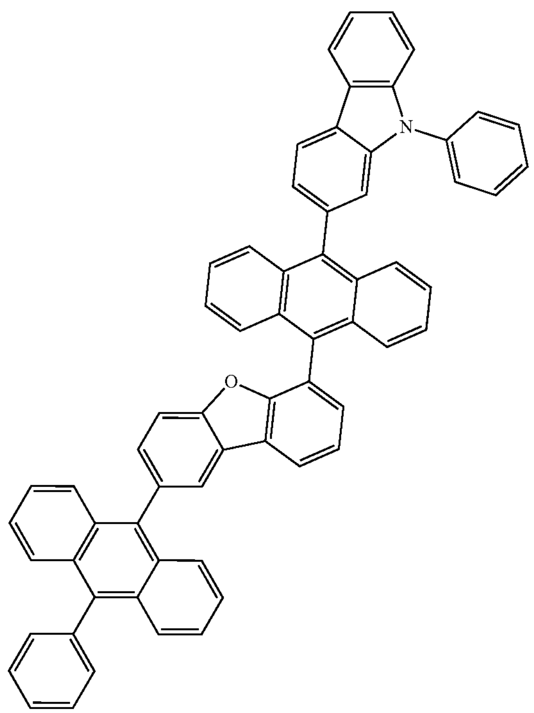
215
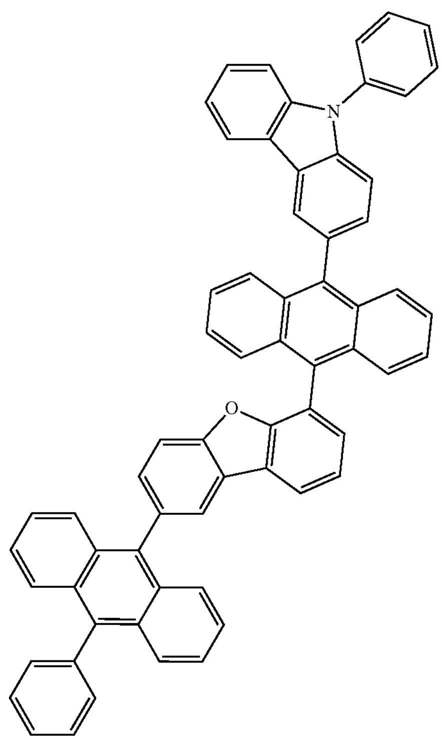

-continued
216
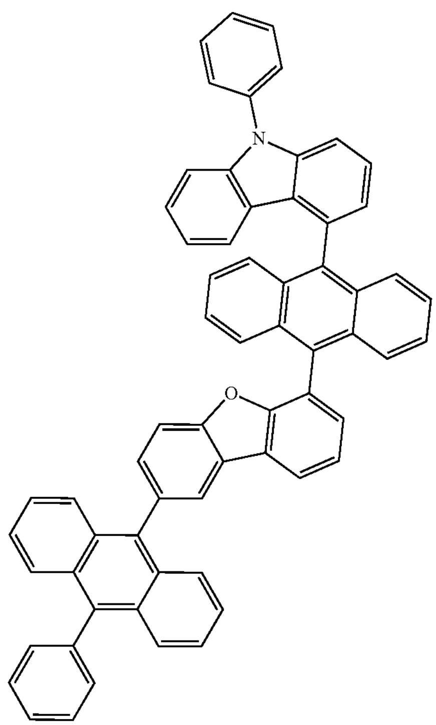
217
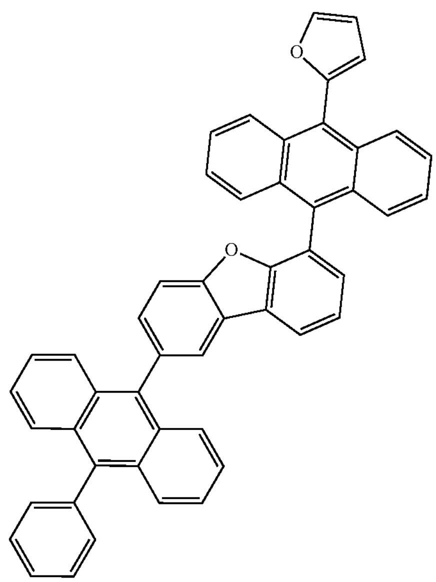
218
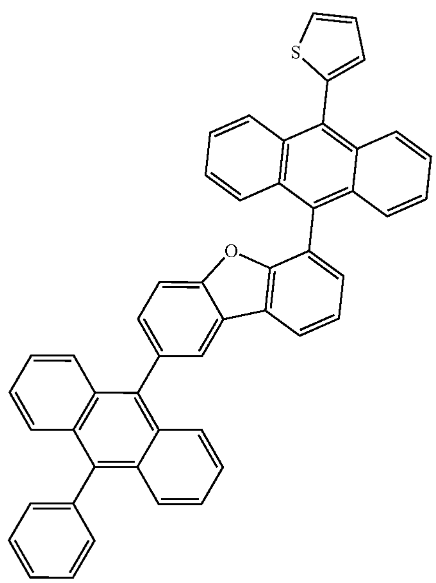
219
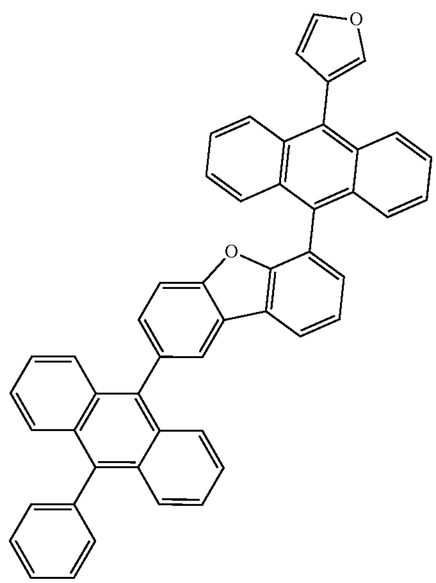

-continued
220
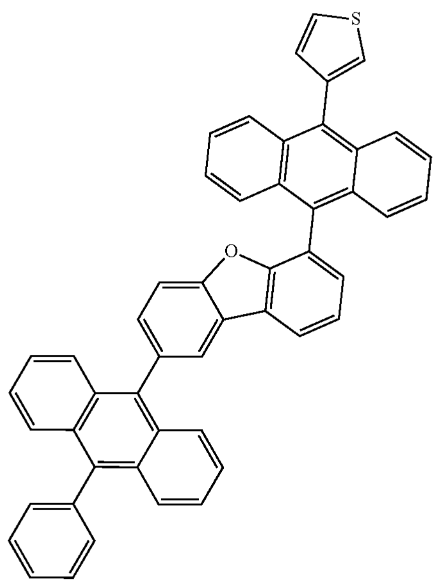
221
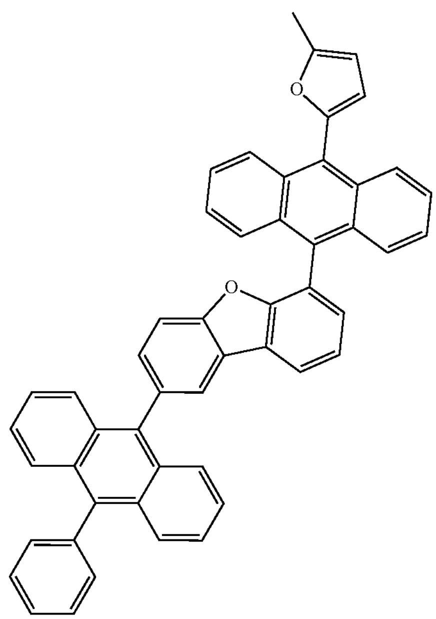
222
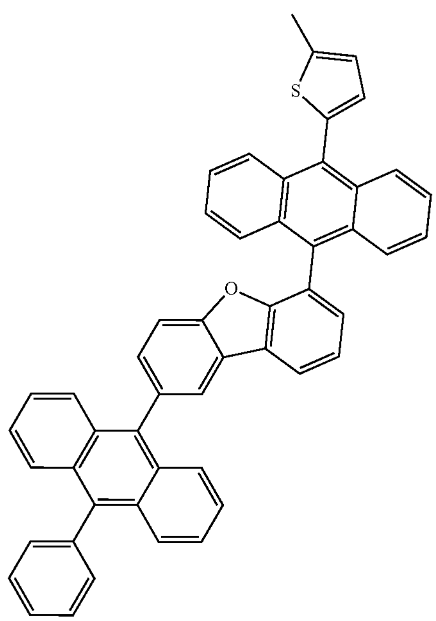
223
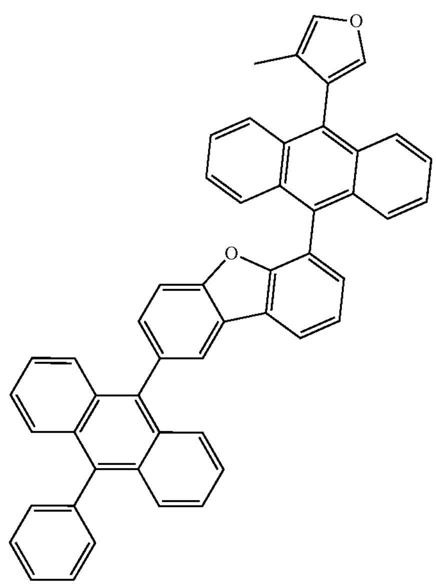

-continued
224
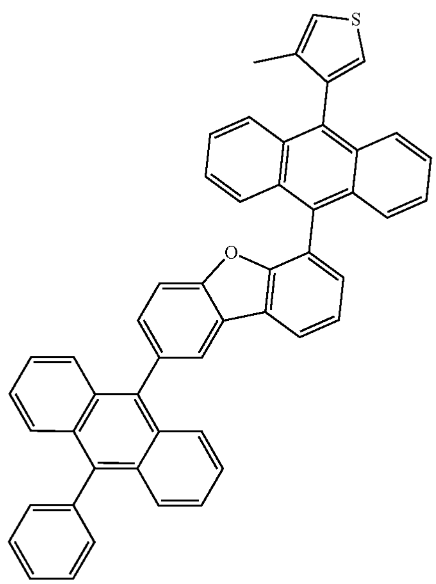
225
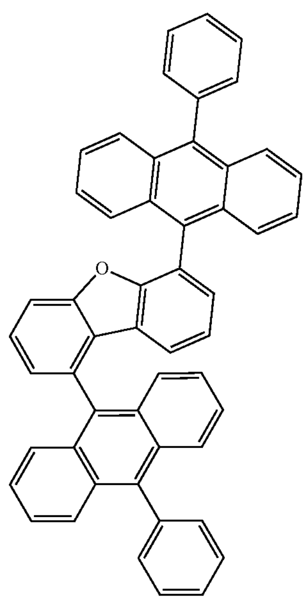
226
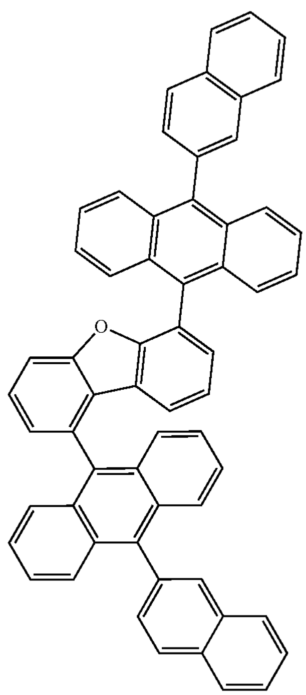
227
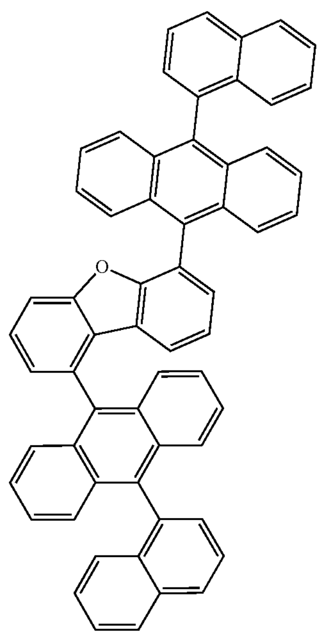

-continued
228
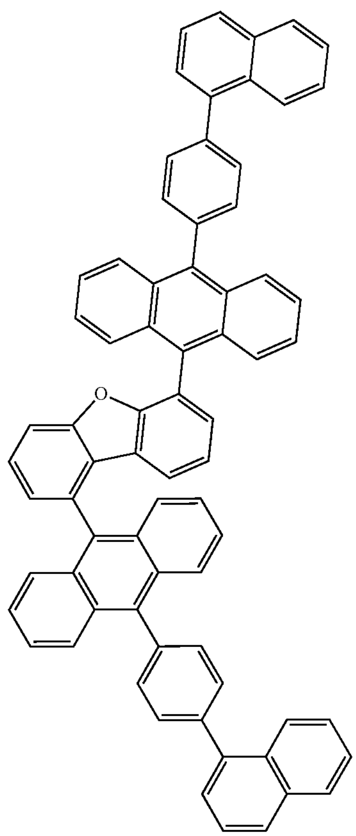
229
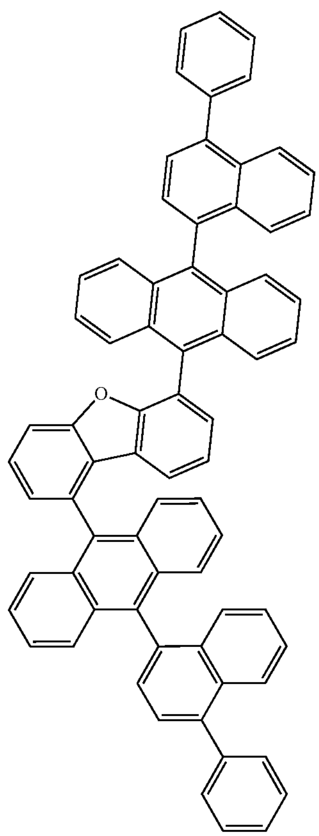
230
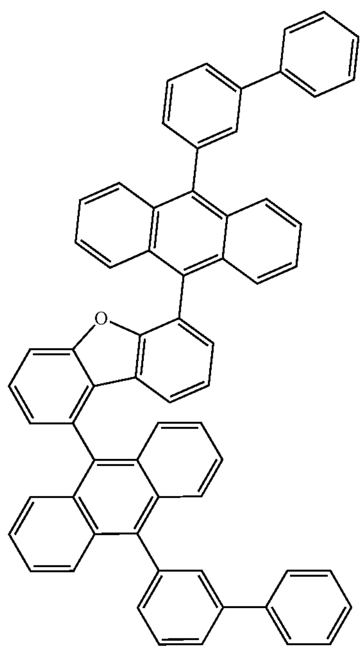
231
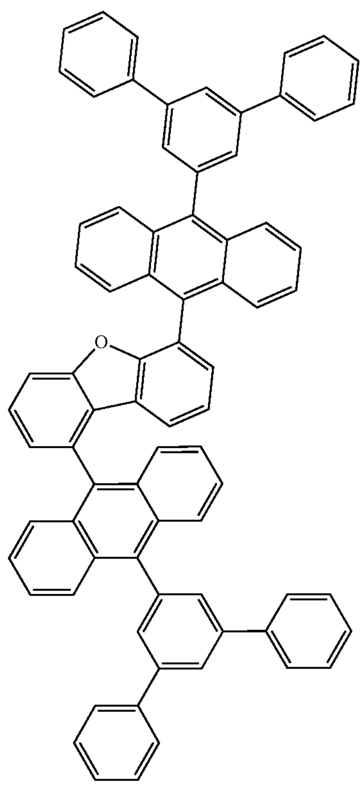

-continued
232
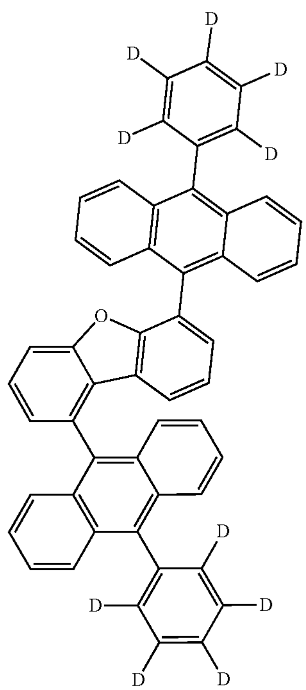
233
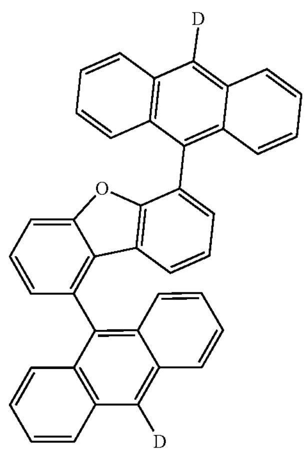
234
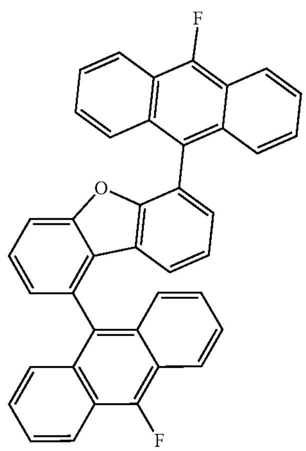
235
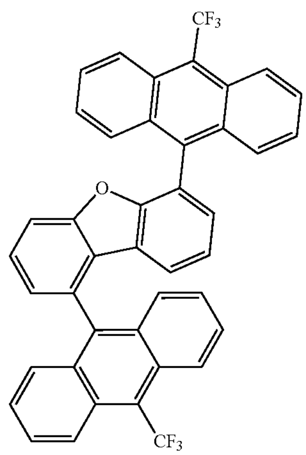
236
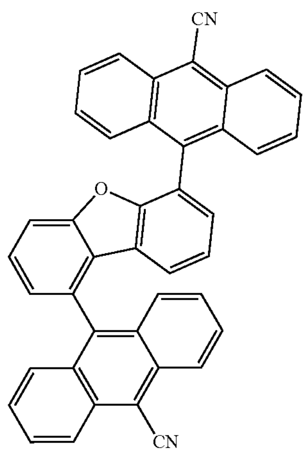
237
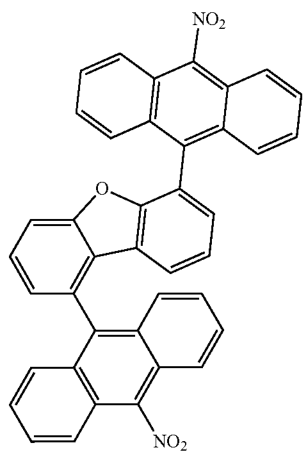

-continued
238
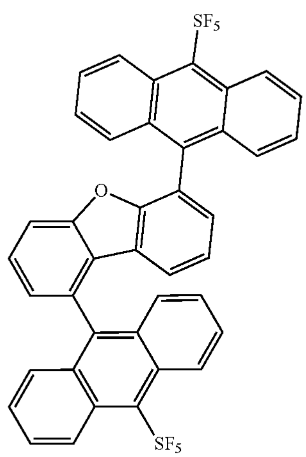
239
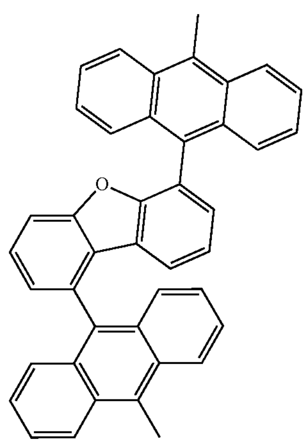
240
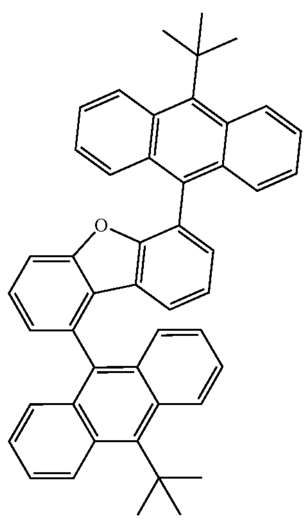
241
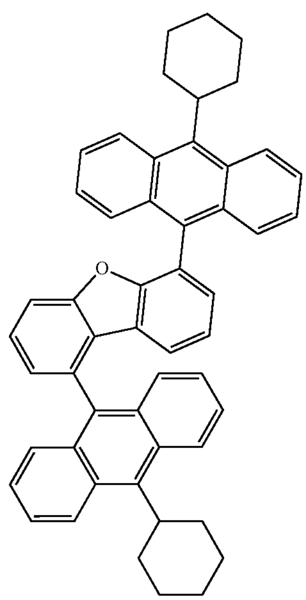
242
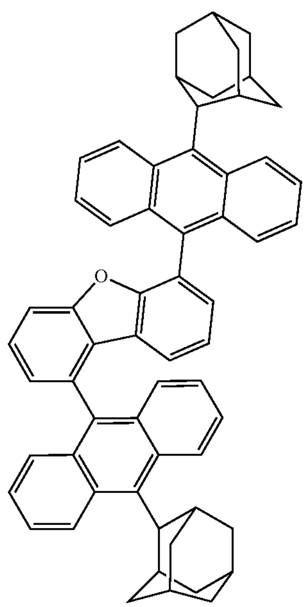
243
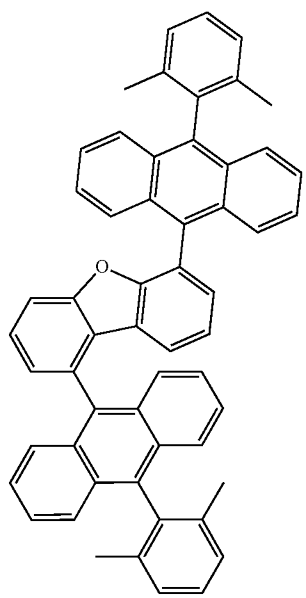

-continued
244
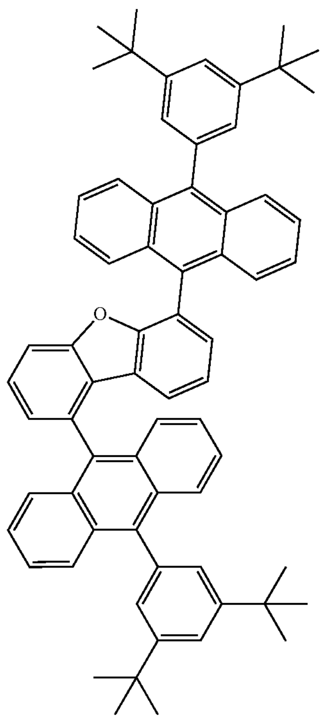
245
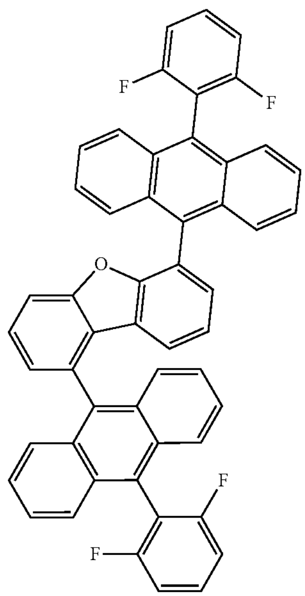
246
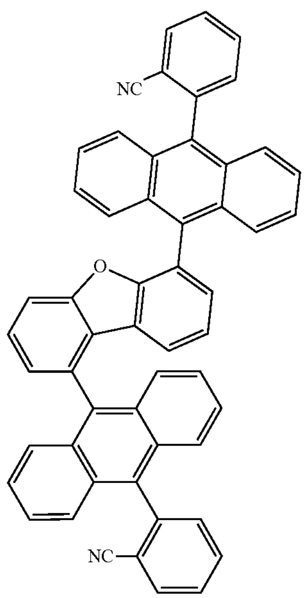
247
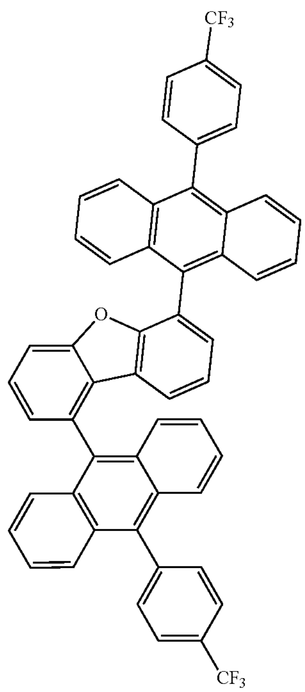

-continued
248
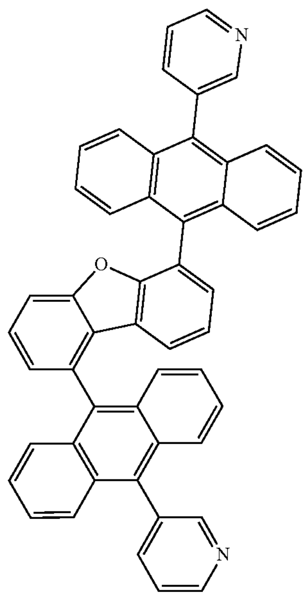
249
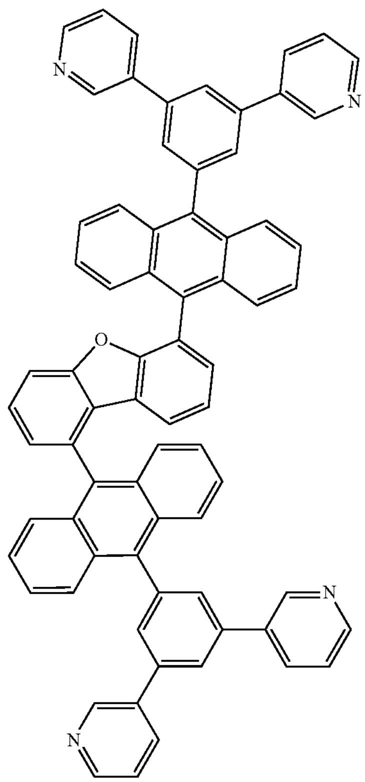
250
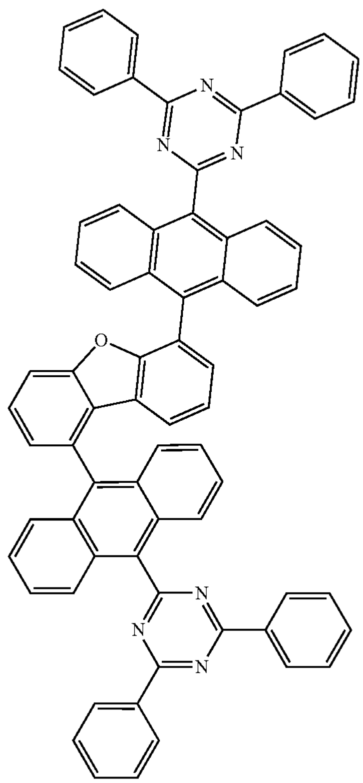
251
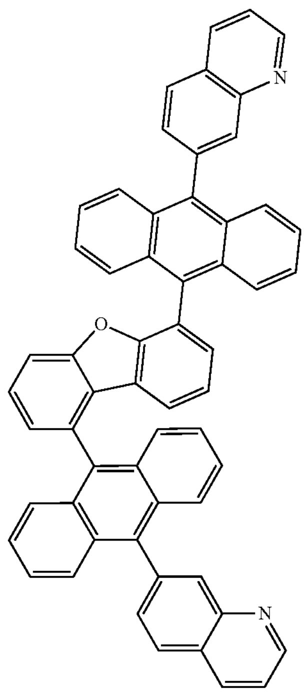

-continued
252
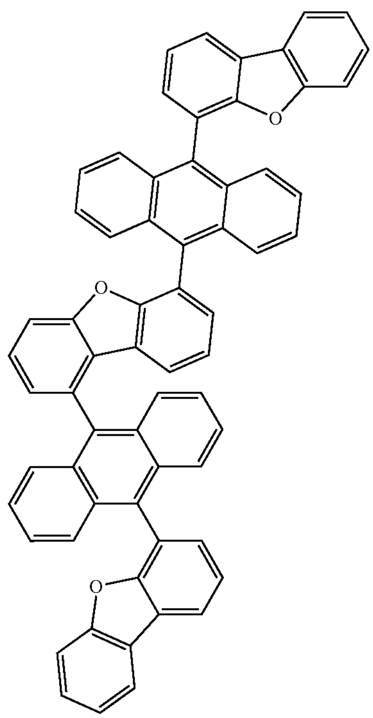
253
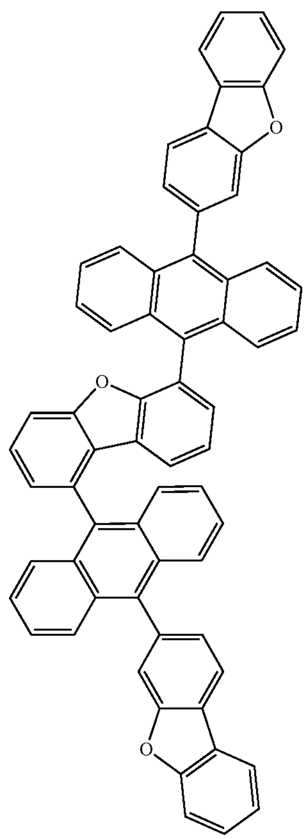
254
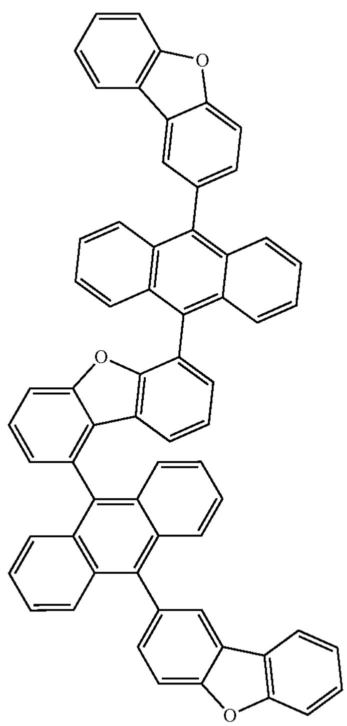
255
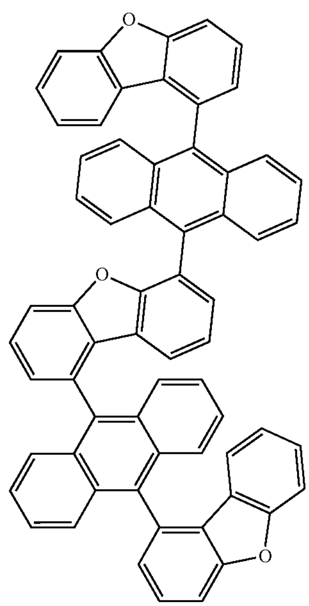

-continued
256
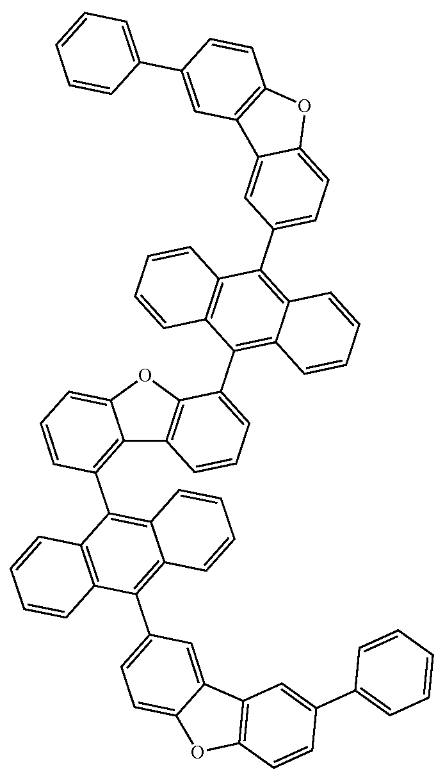
257
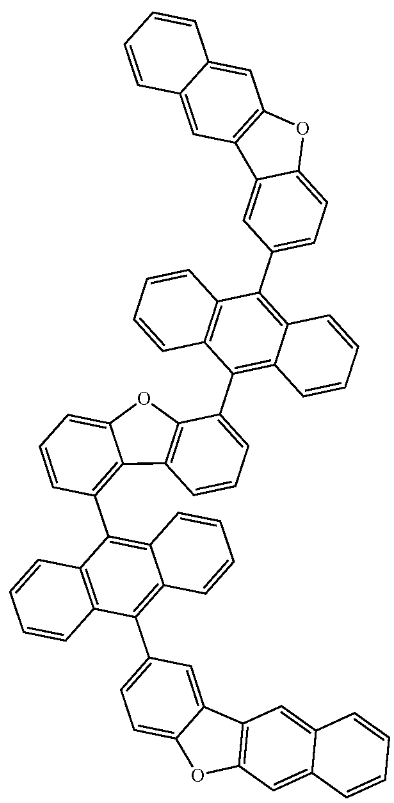
258
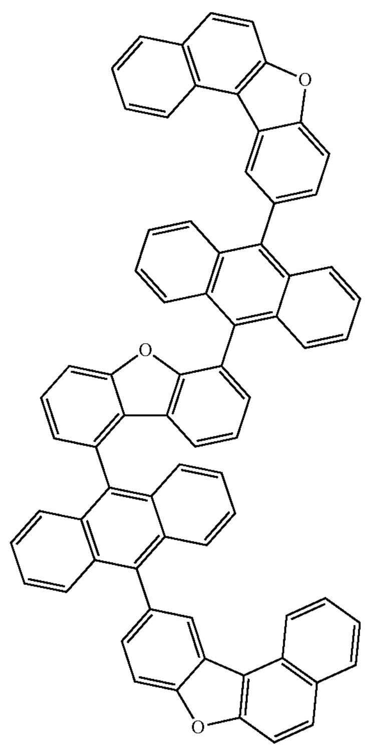
259
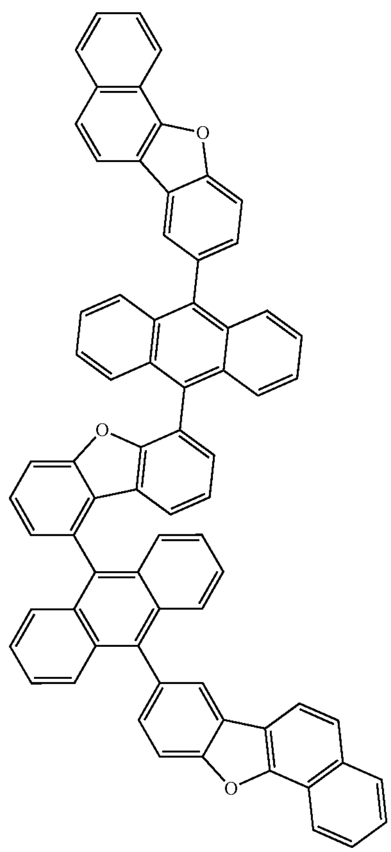

-continued
260
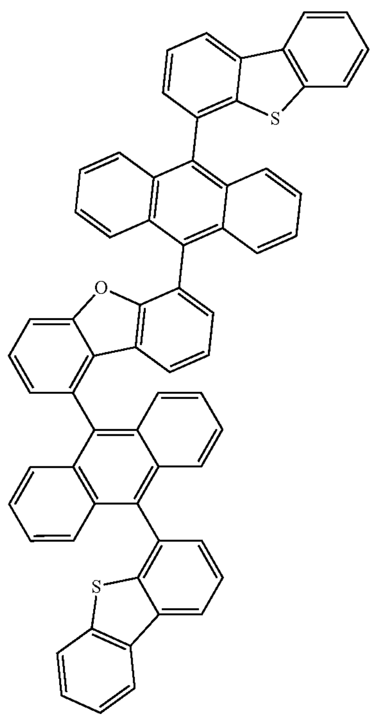
261
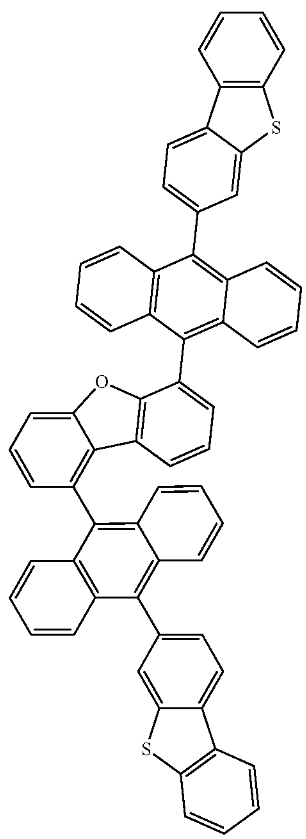
262
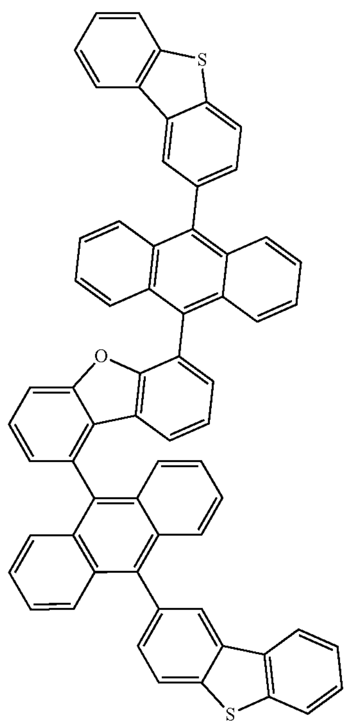
263
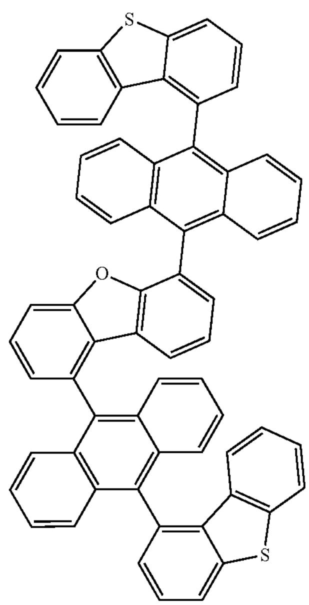

-continued
264
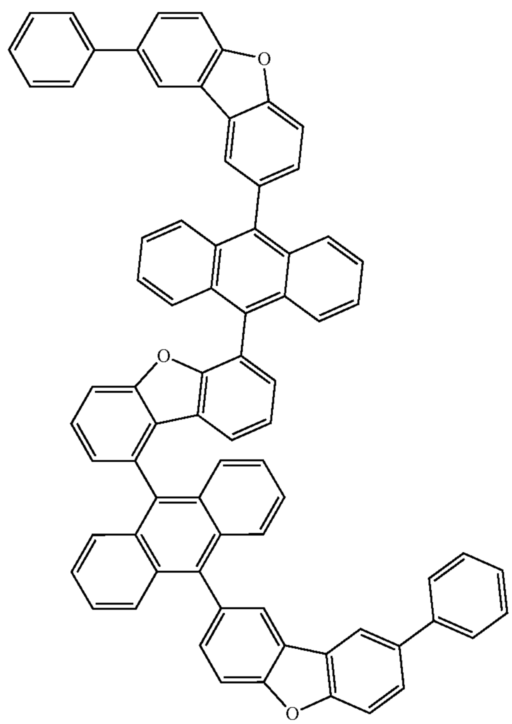
265
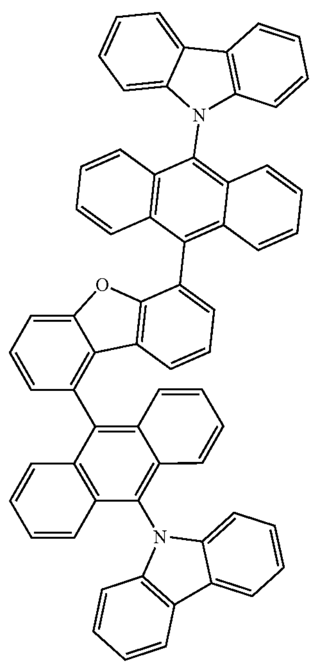
266
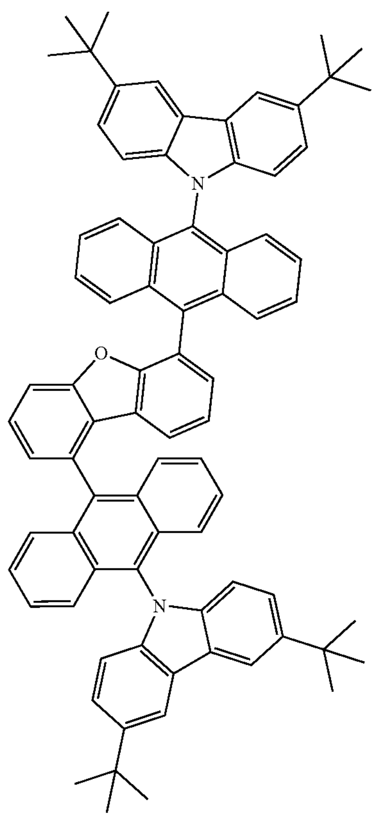
267
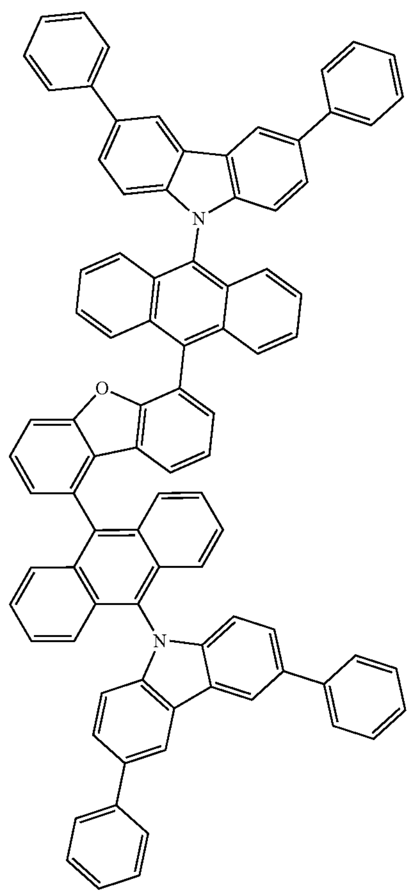

-continued
268
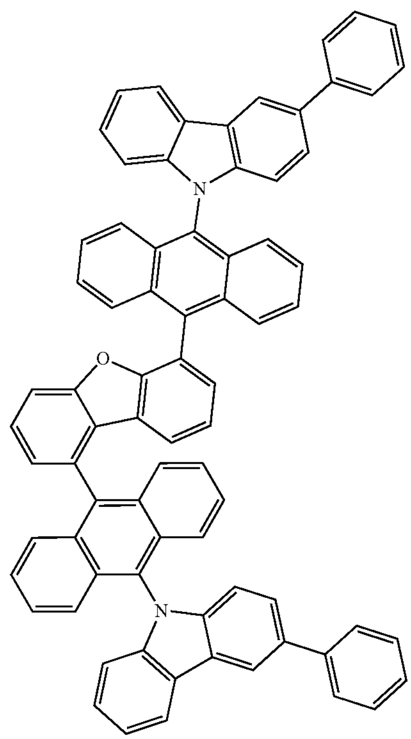
269
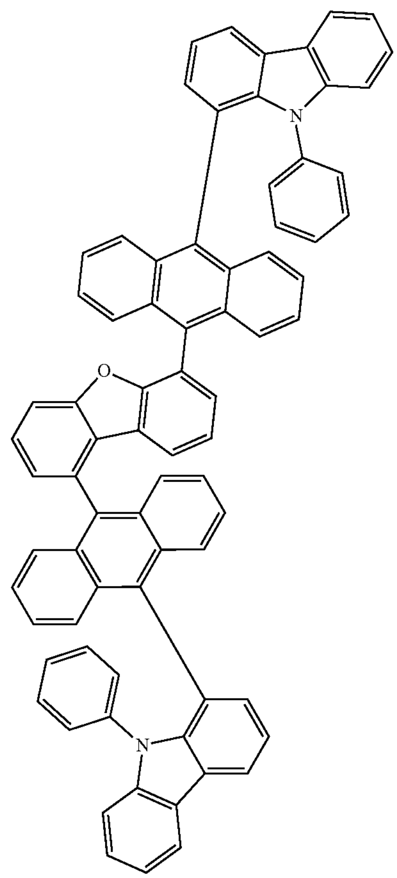

-continued
270
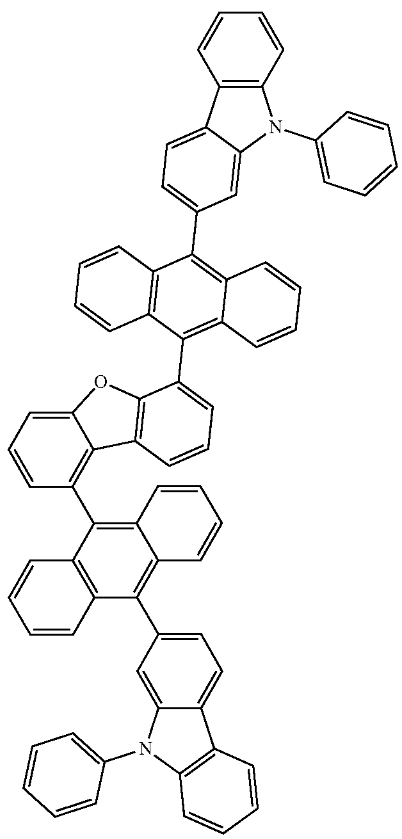
271
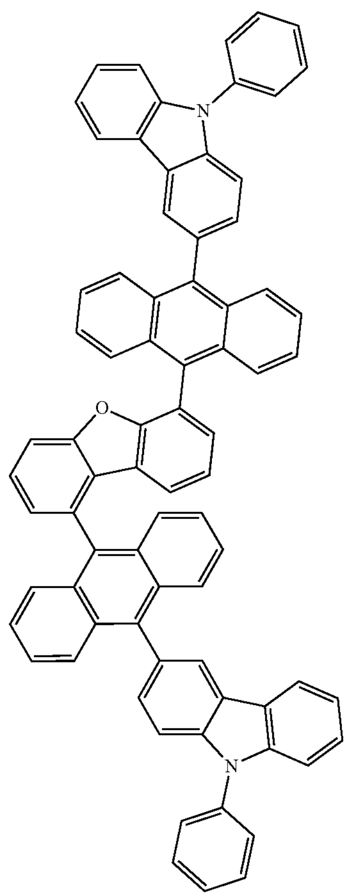
272
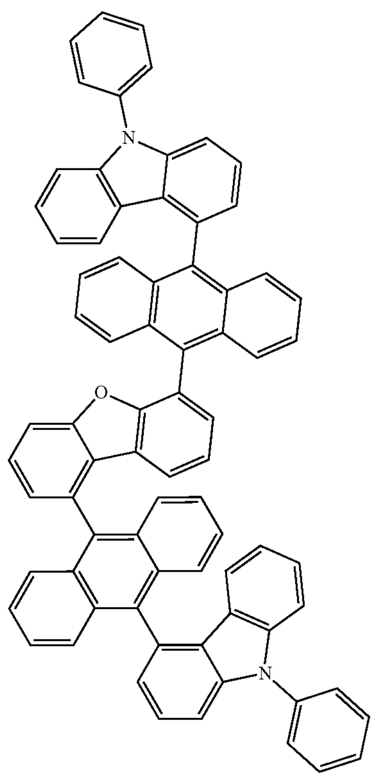
273
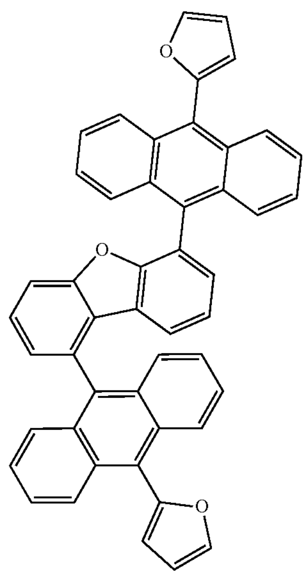

-continued
274
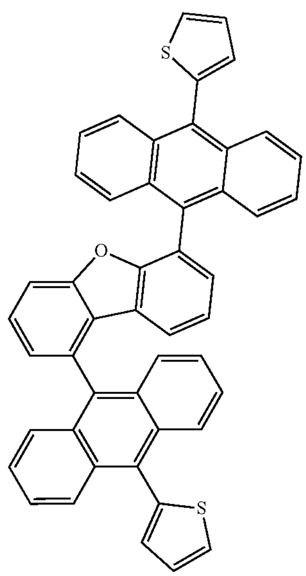
275
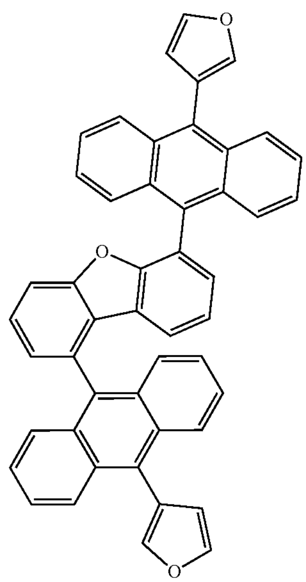
276
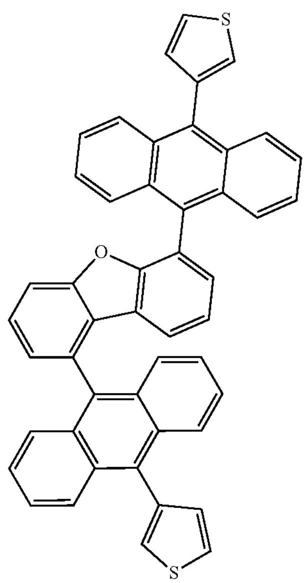
277
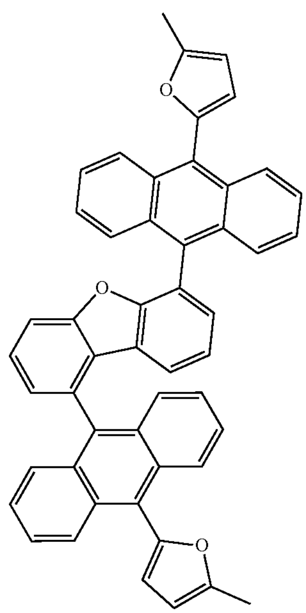

-continued
278
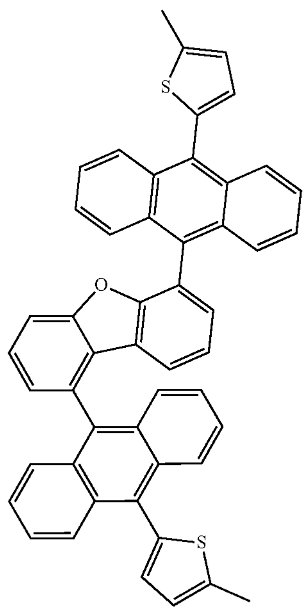
279
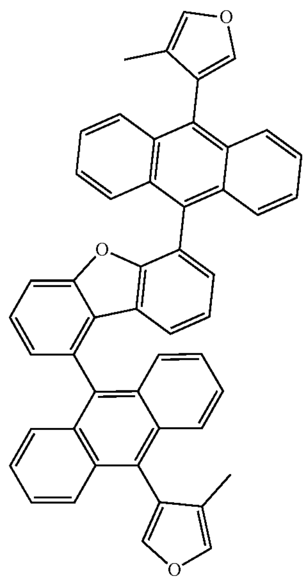
280
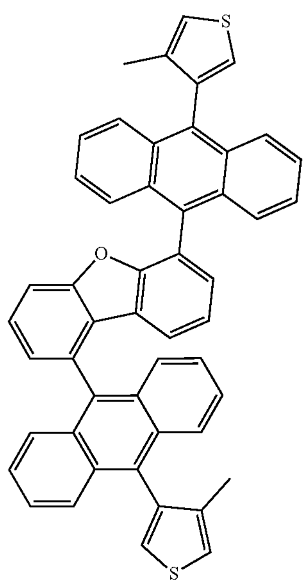
281
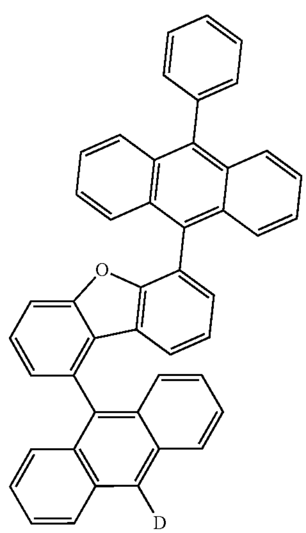

-continued
282
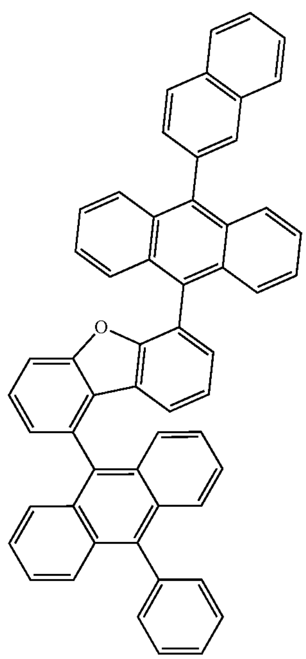
283
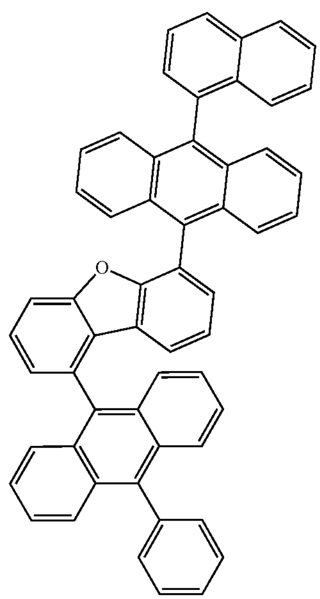
284
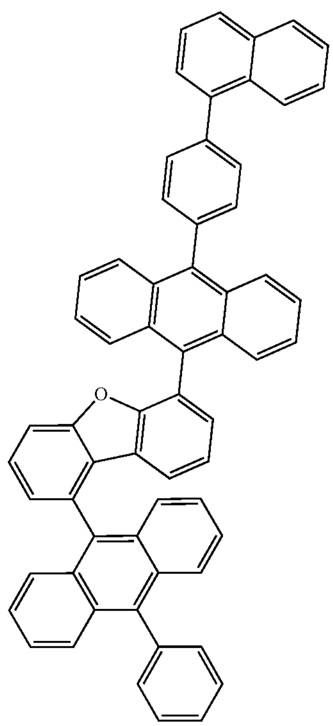
285
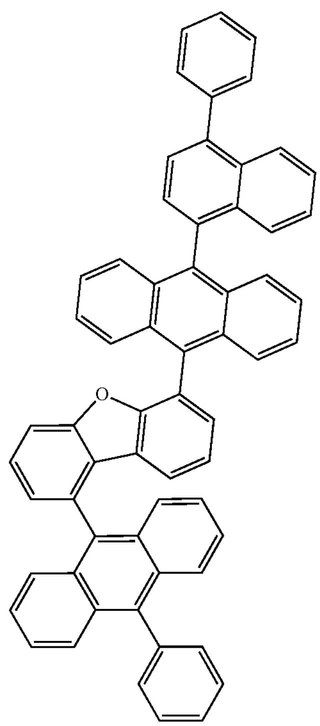

-continued
286
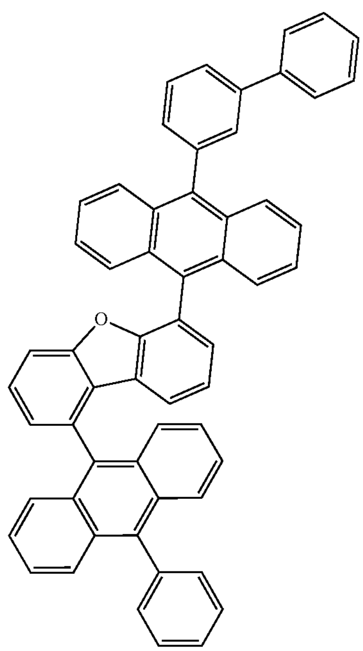
287
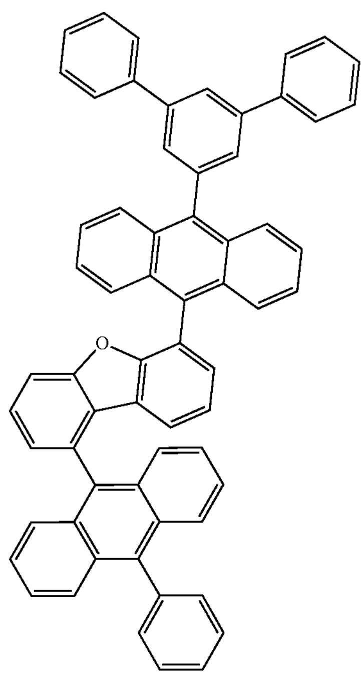
288
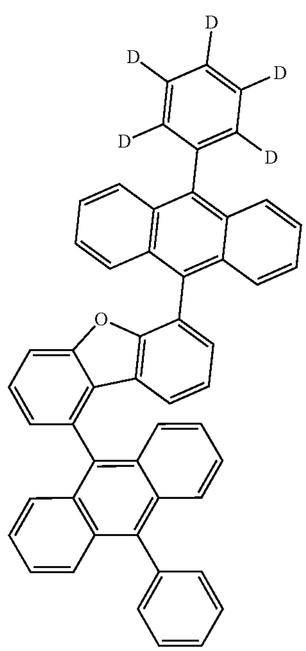
289
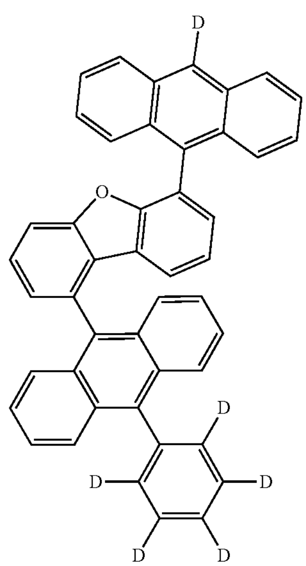

-continued
290
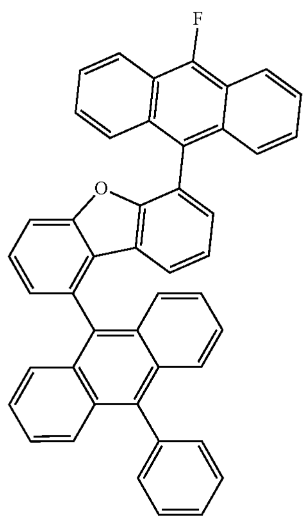
291
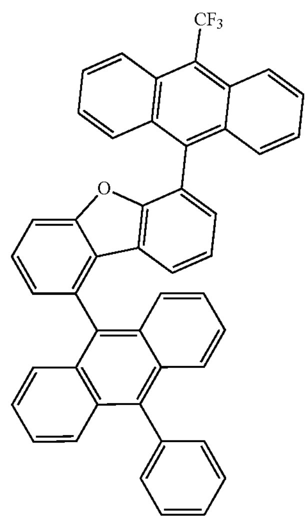
292
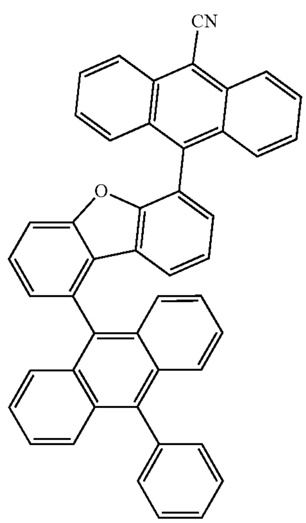
293
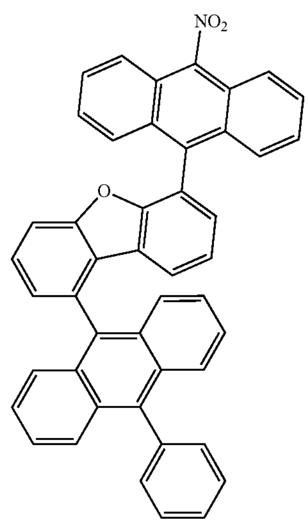
294
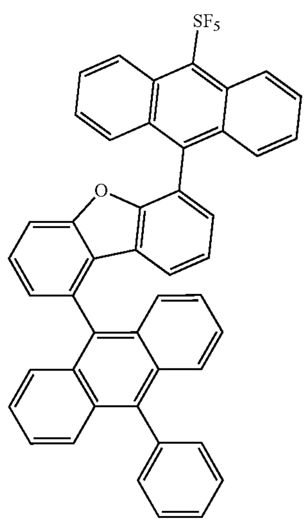
295
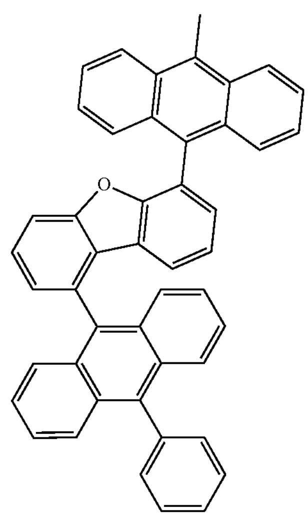

-continued
296
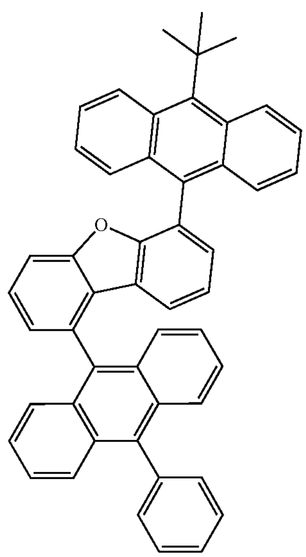
297
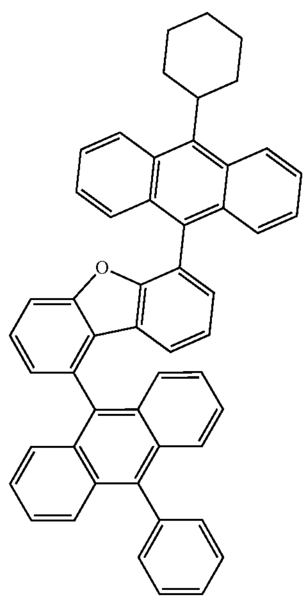
298
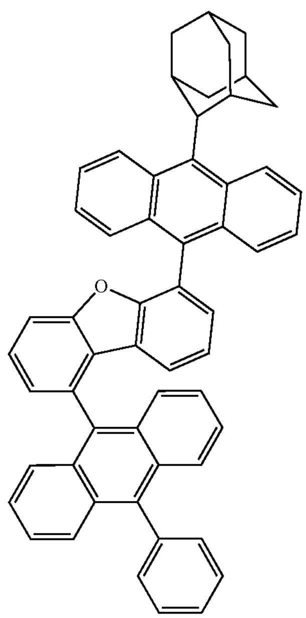
299
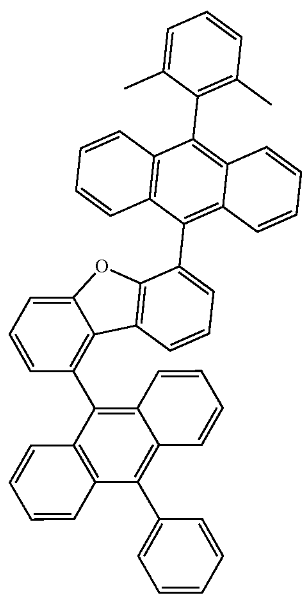

-continued
300
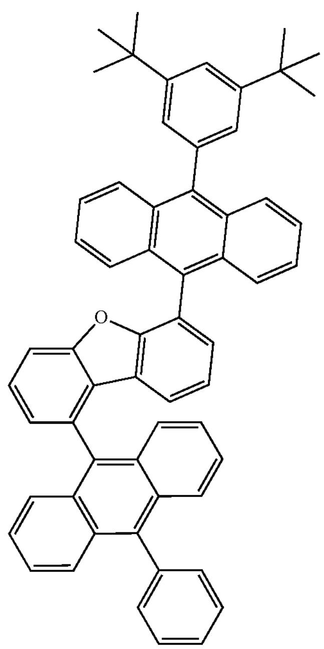
301
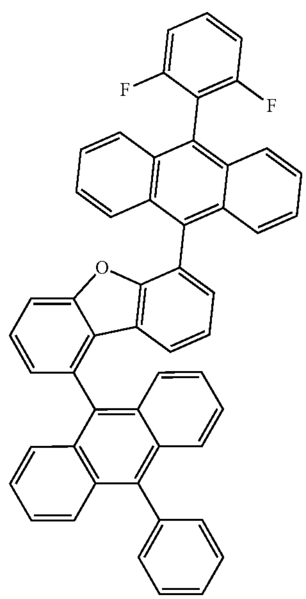
302
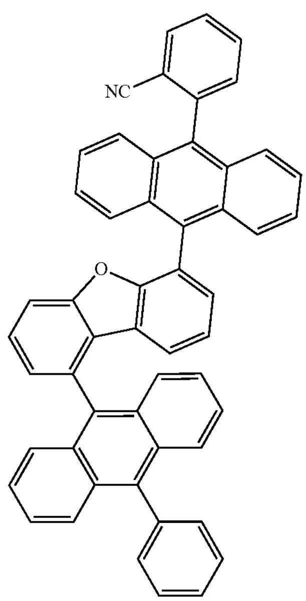
303
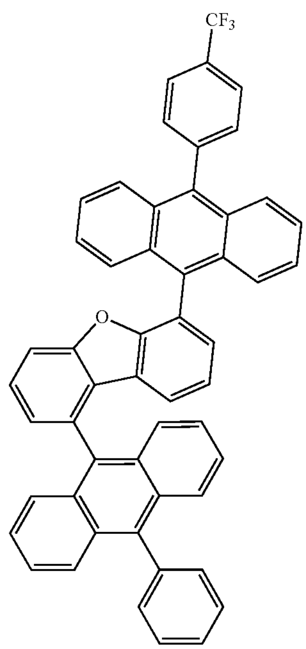

-continued
304
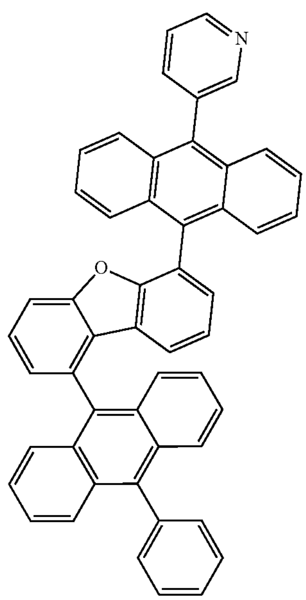
305
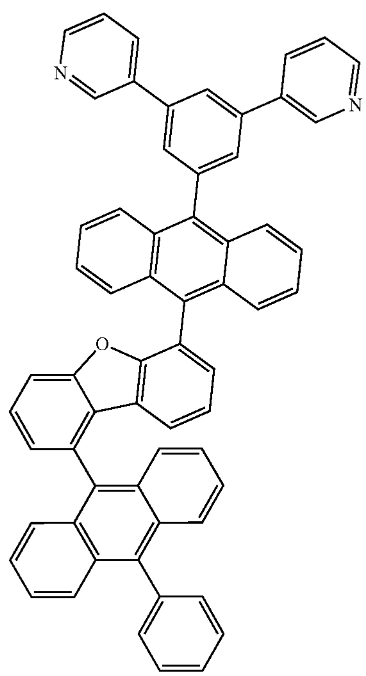
306
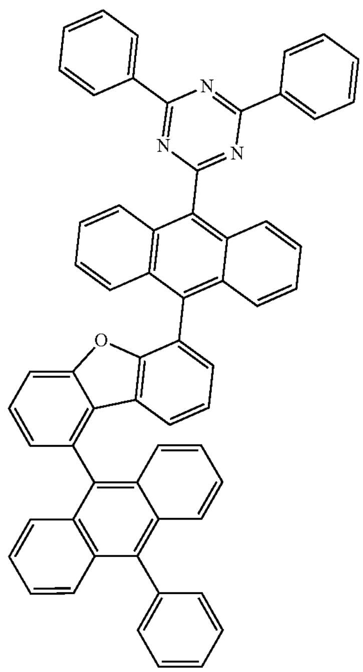
307
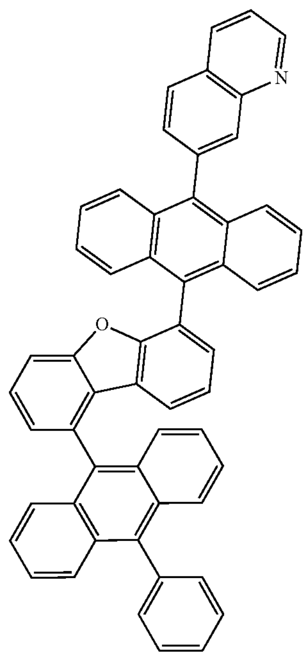

-continued
308
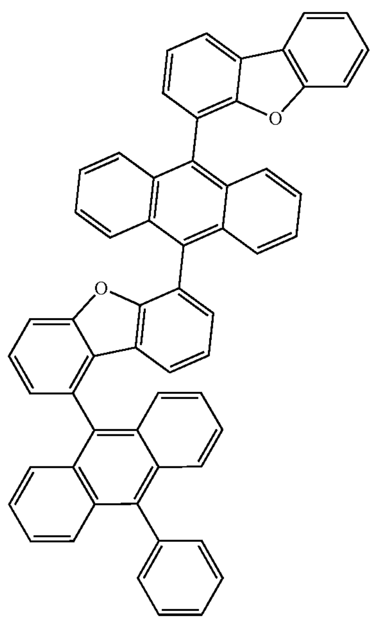
309
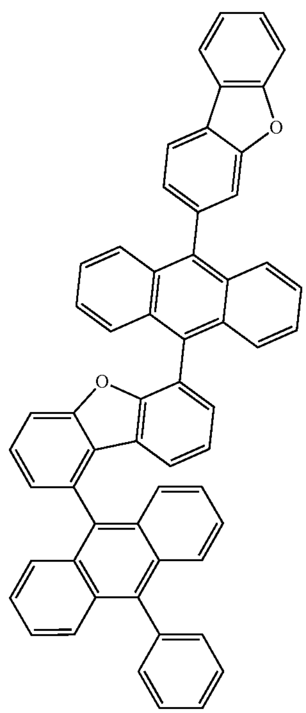
310
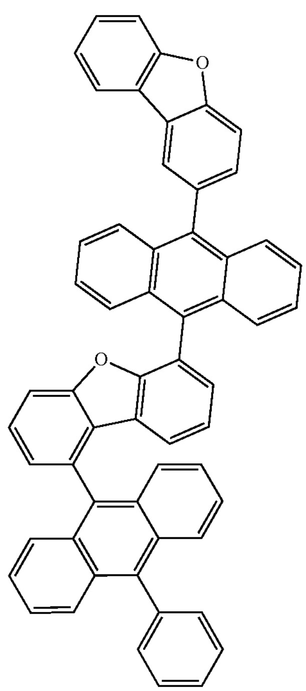
311
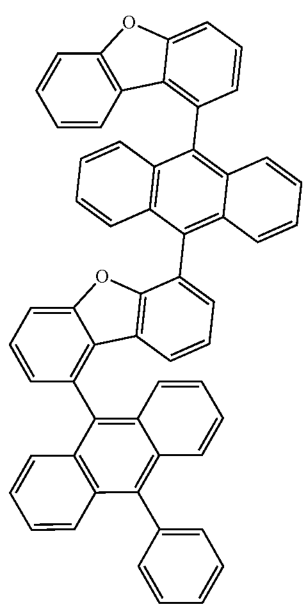

-continued
312
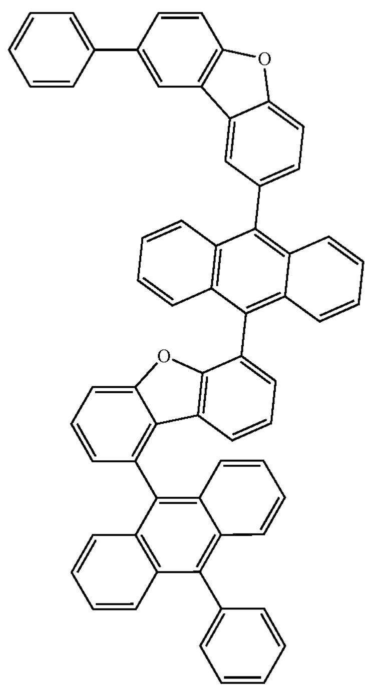
313
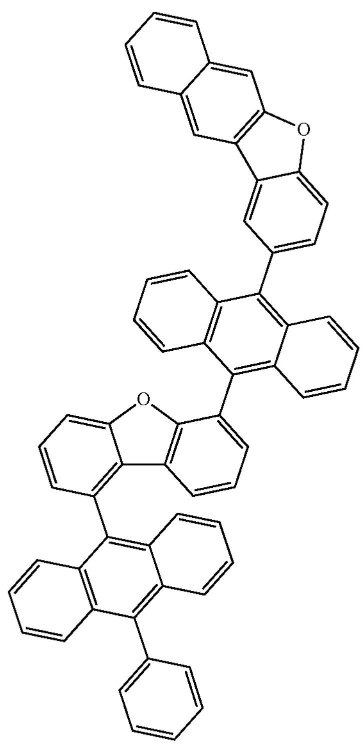
314
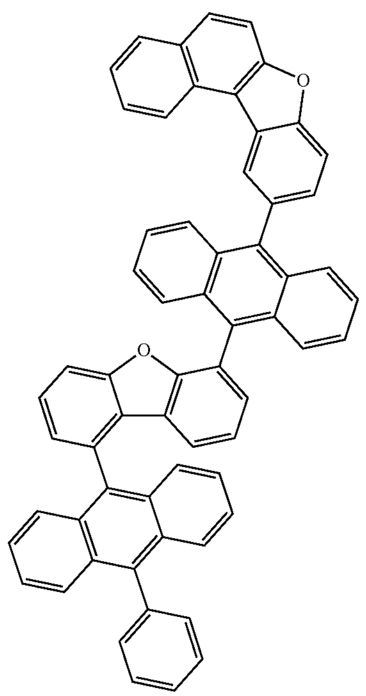
315
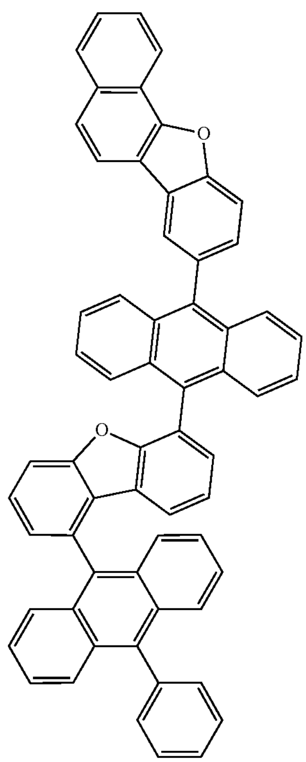

-continued
316
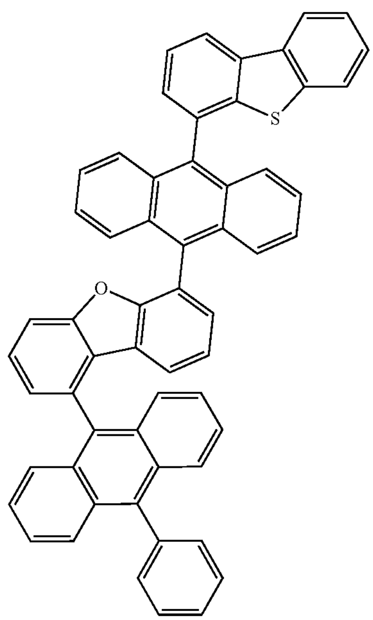
317
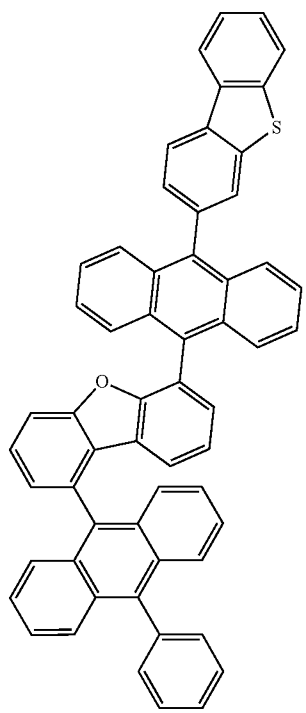
318
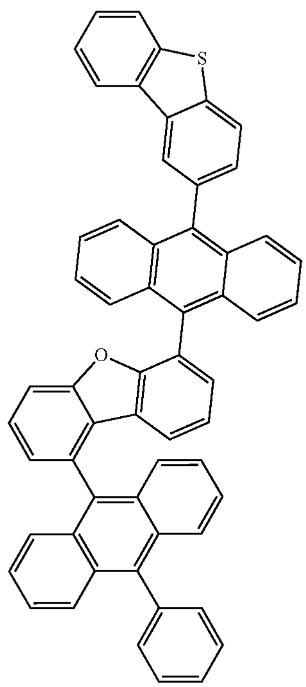
319
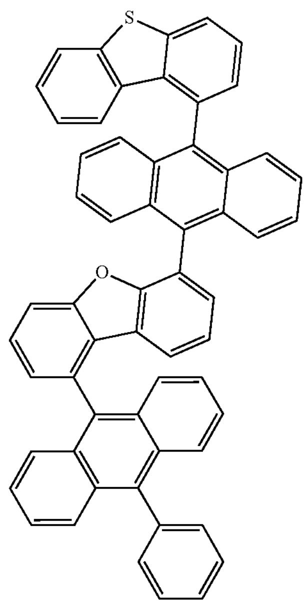

-continued
320
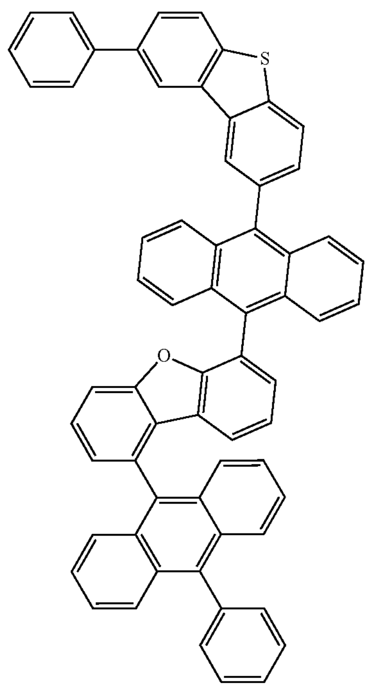
321
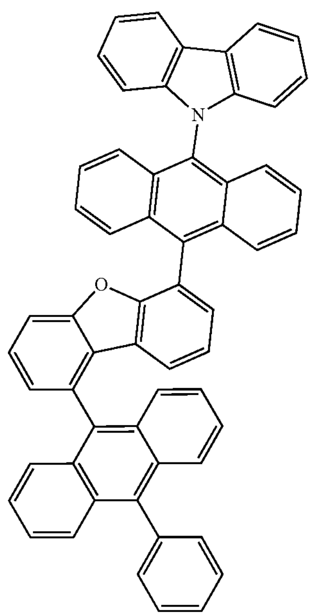
322
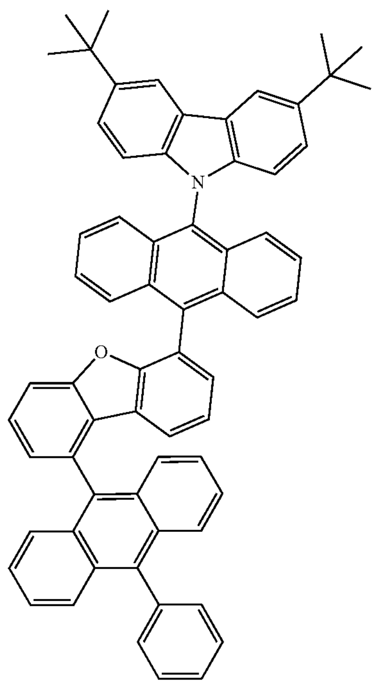
323
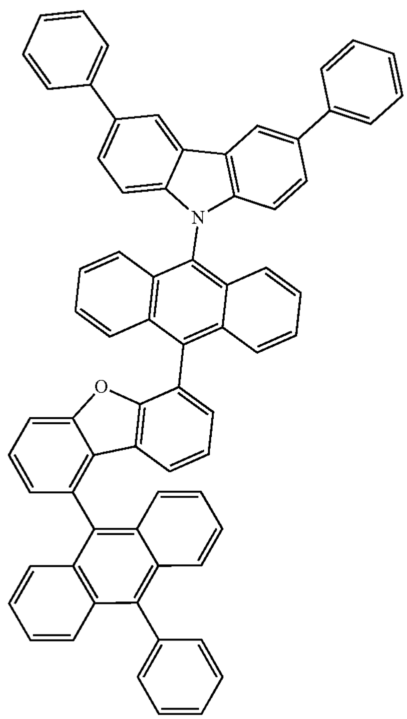

-continued
324
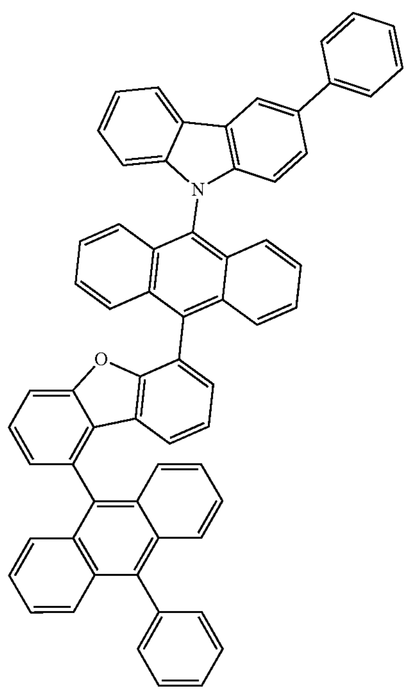
325
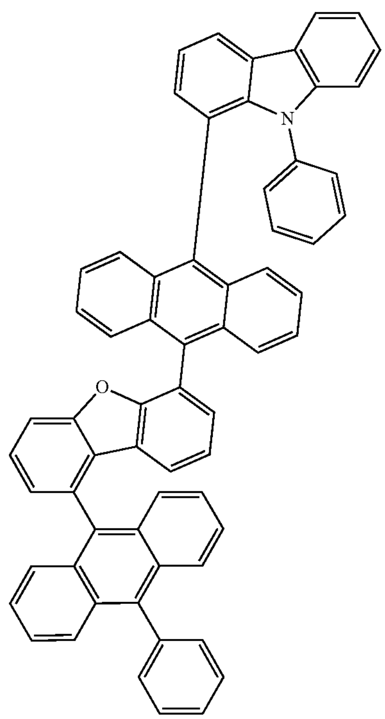
326
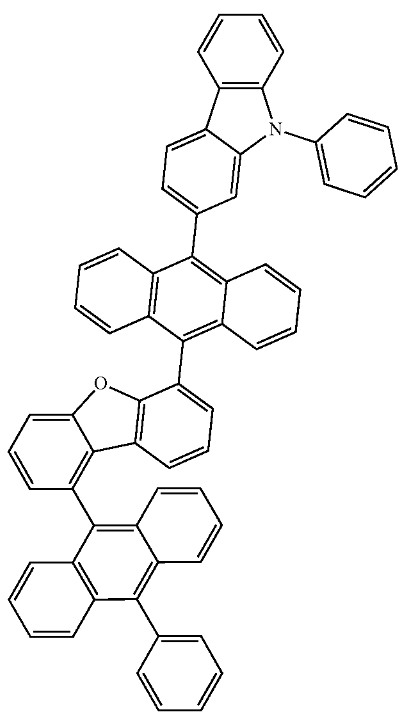
327
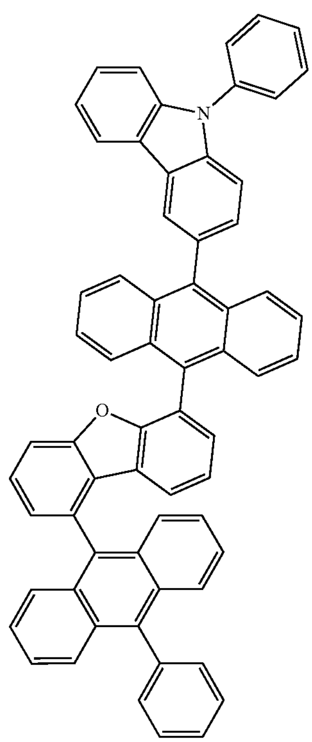

-continued
328
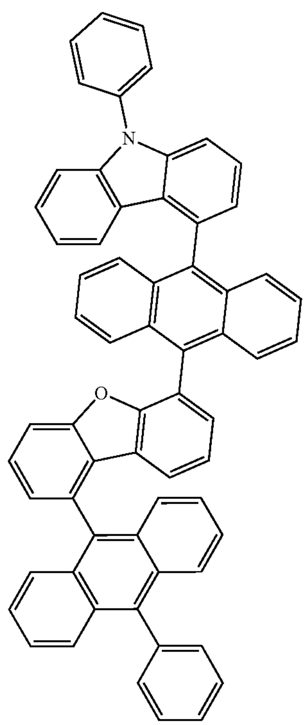
329
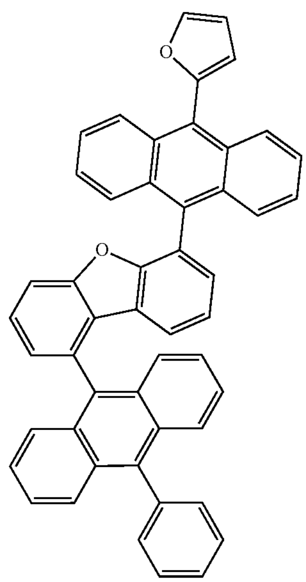
330
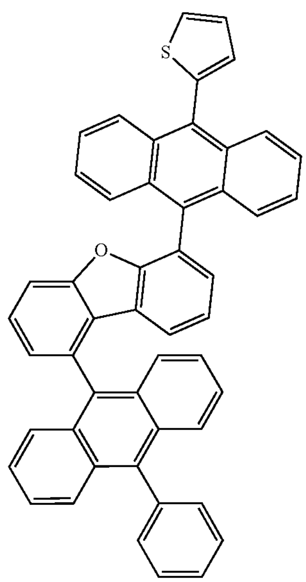
331
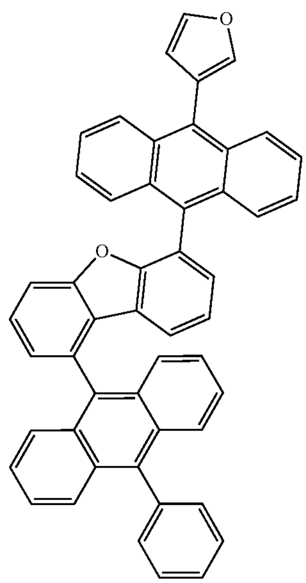

-continued
332
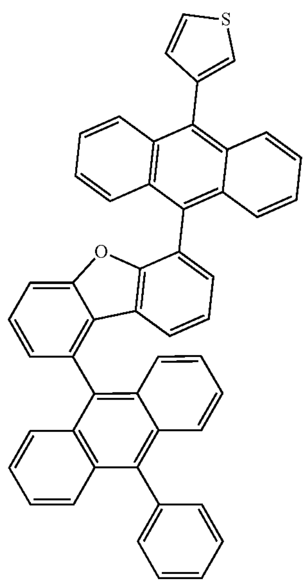
333
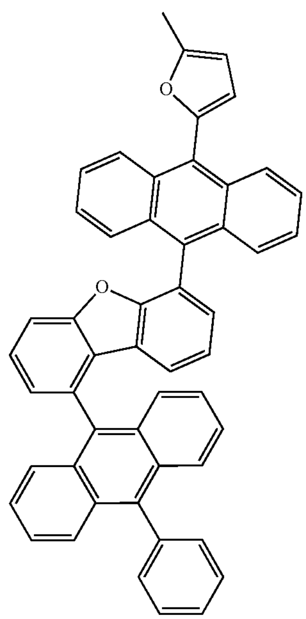
334
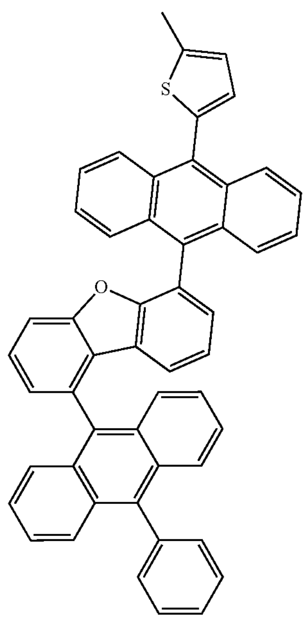
335
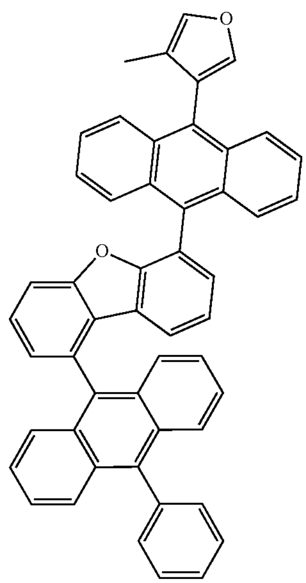

-continued
336
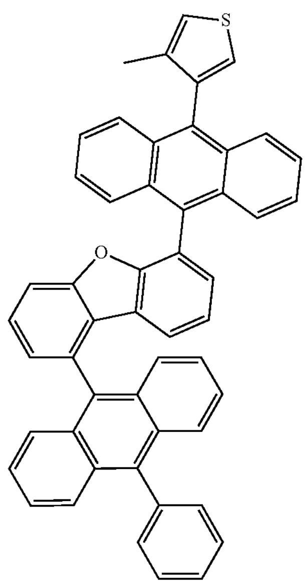
337
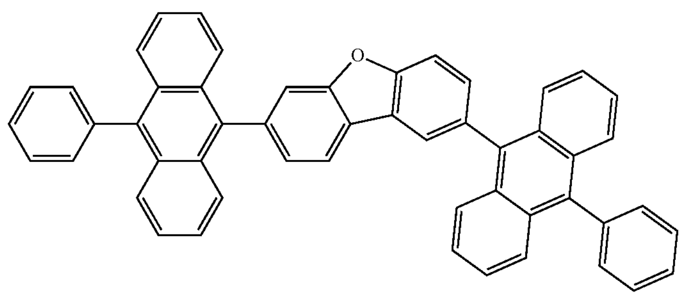
338
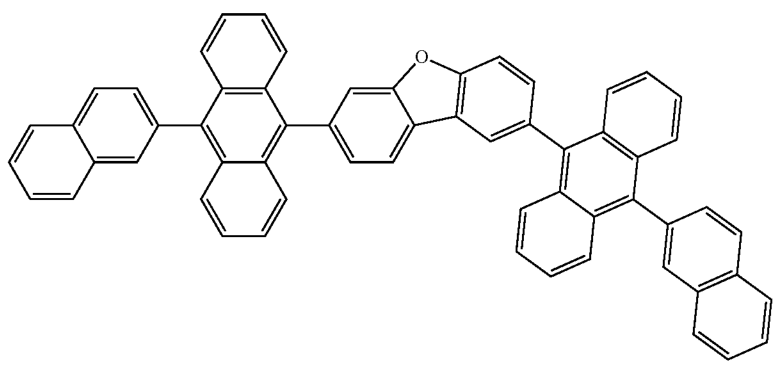
339
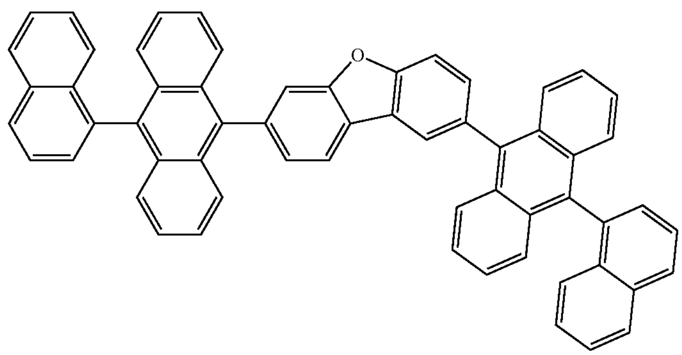

-continued
340
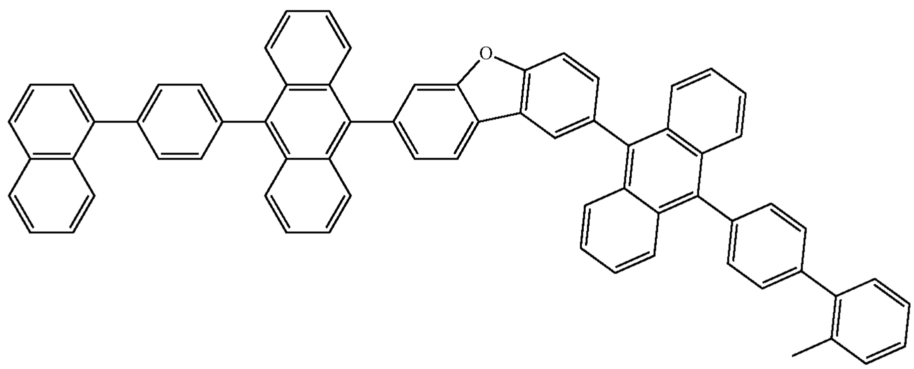
341
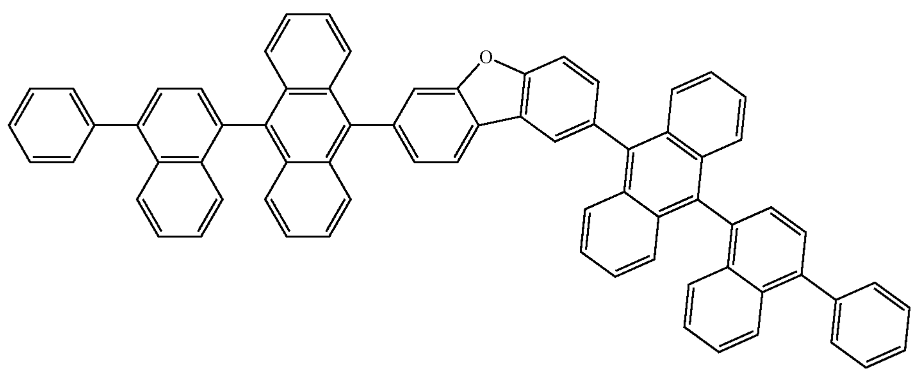
342
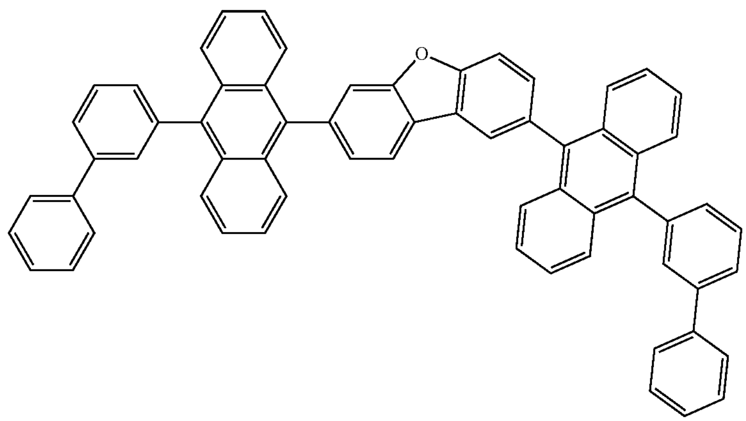
343
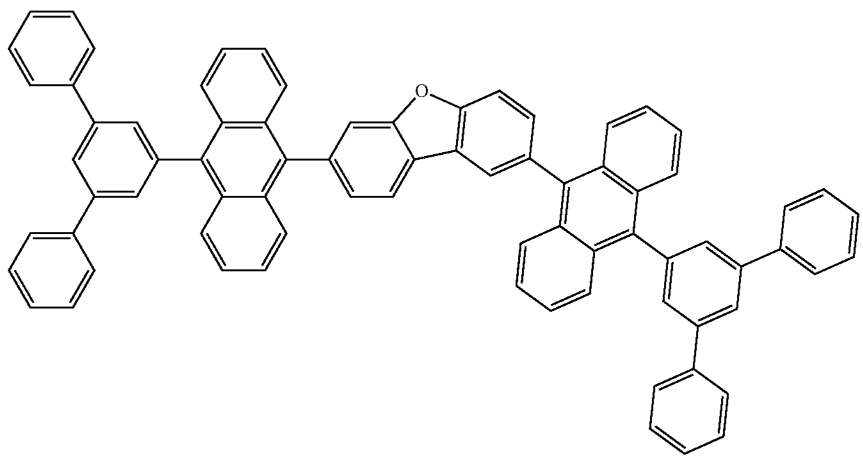

-continued
344
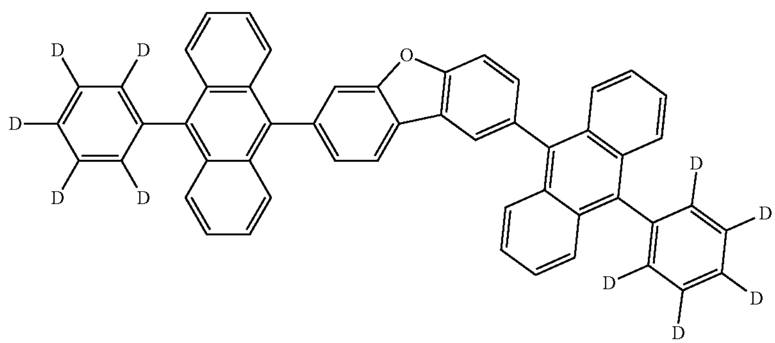
345
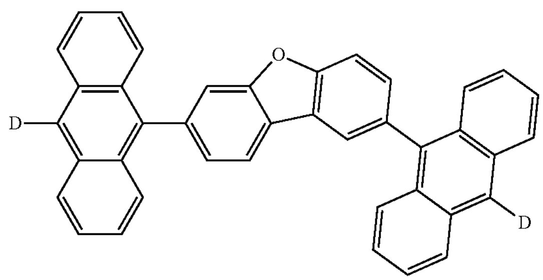
346
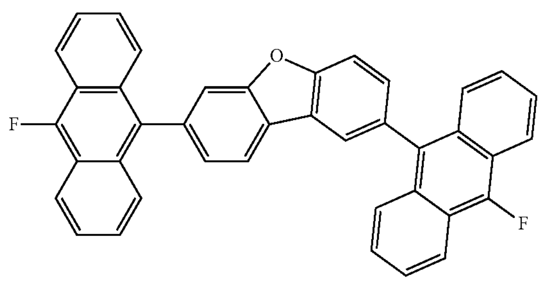
347
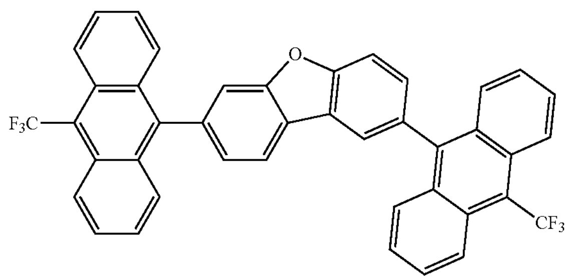
348
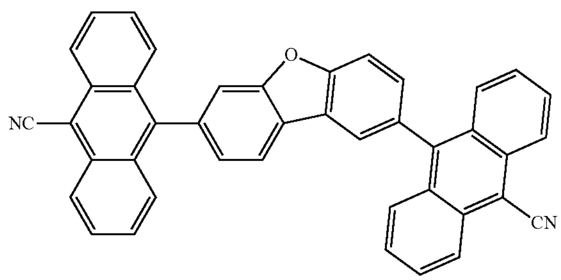

-continued
349
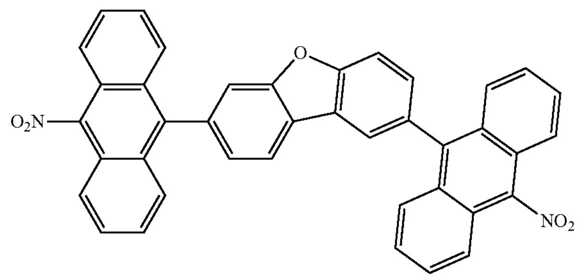
350
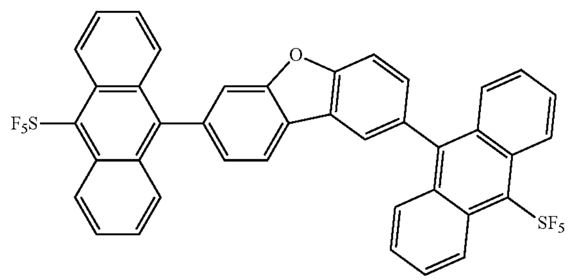
351
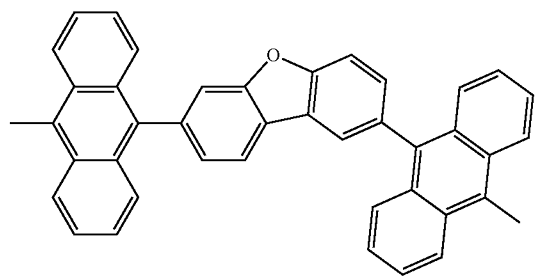
352
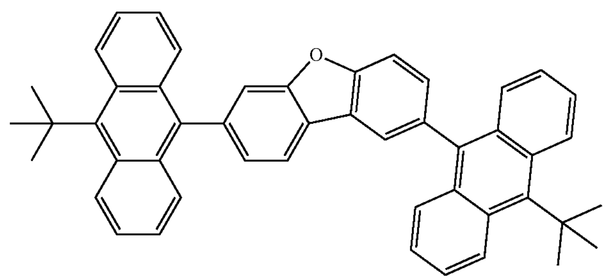
353
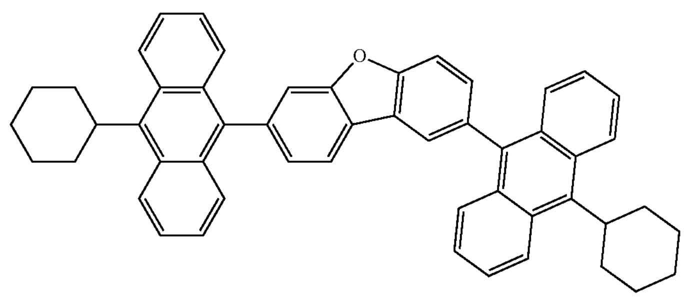

-continued
354
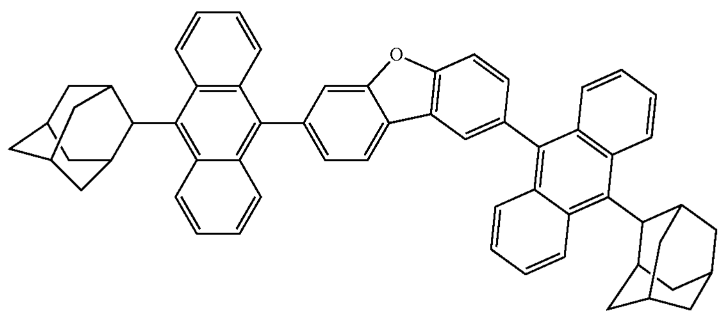
355
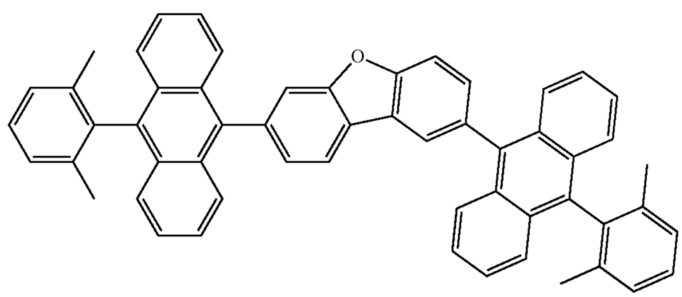
356
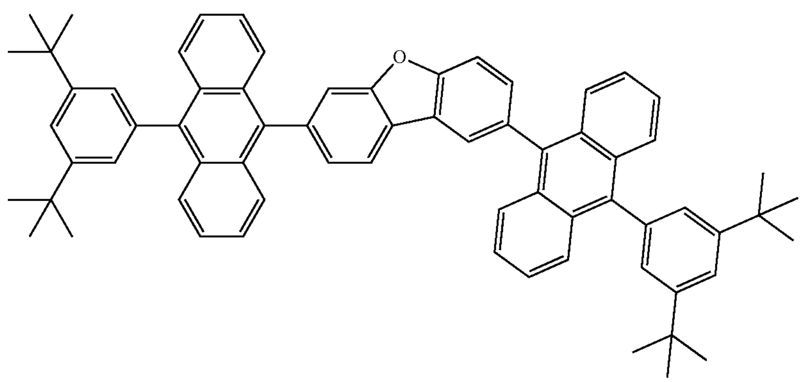
357
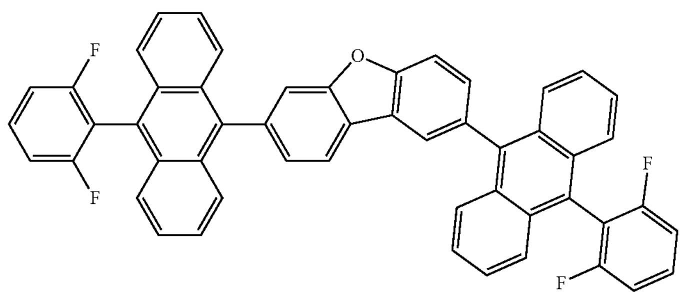
358
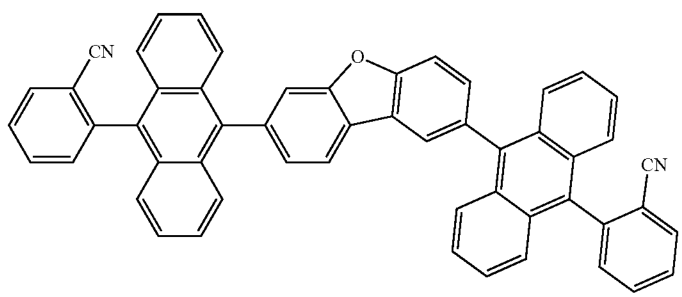

-continued
359
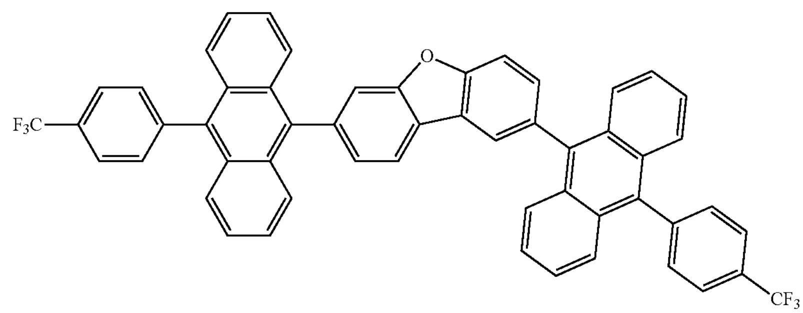
360
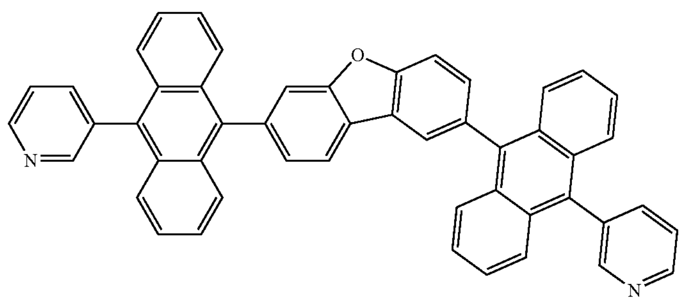
361
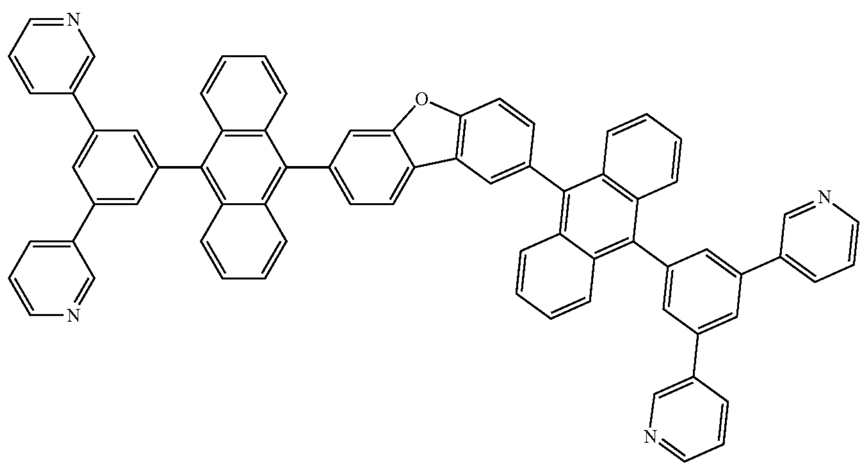
362
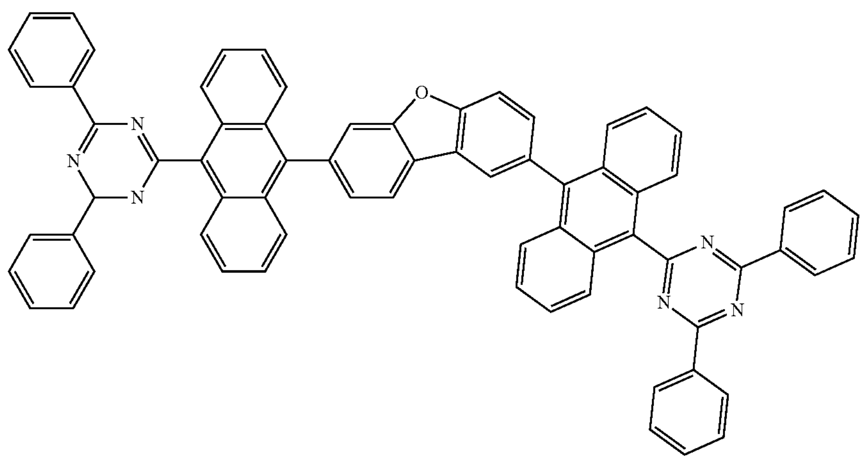

-continued
363
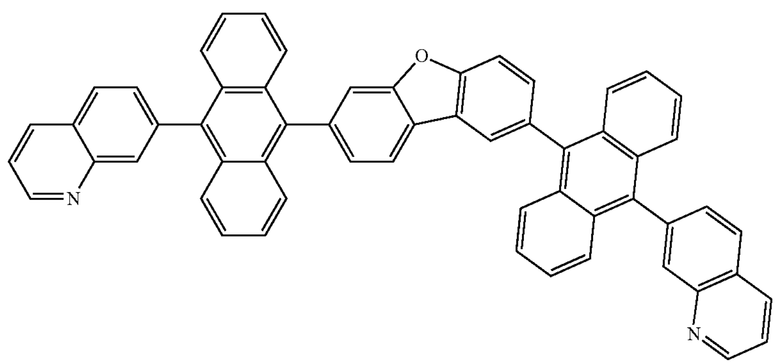
364
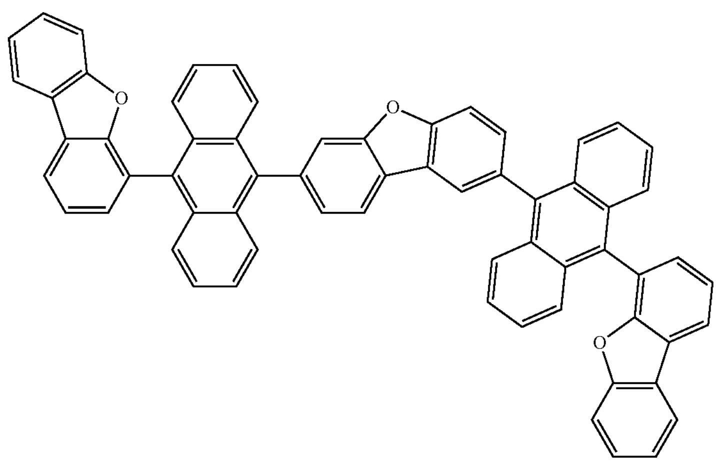
365
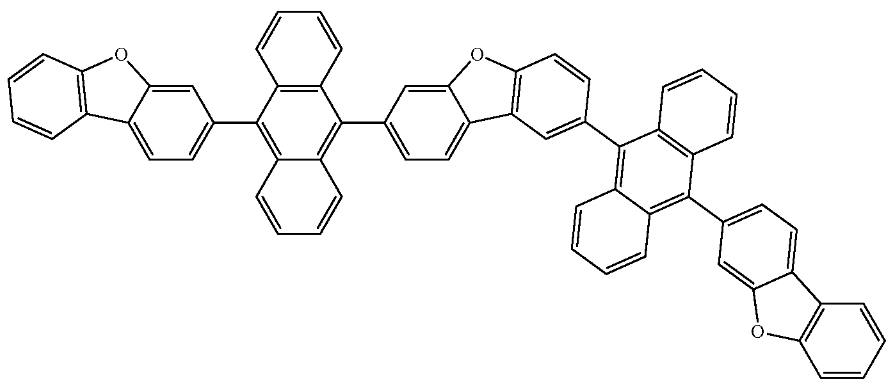
366
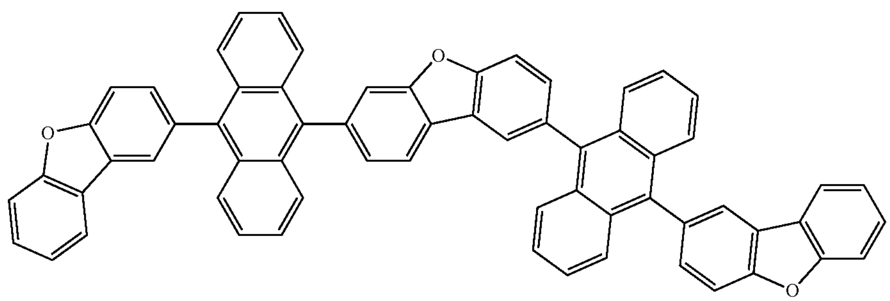

-continued
367
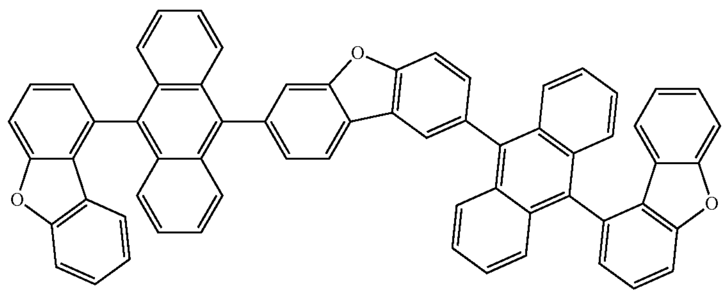
368
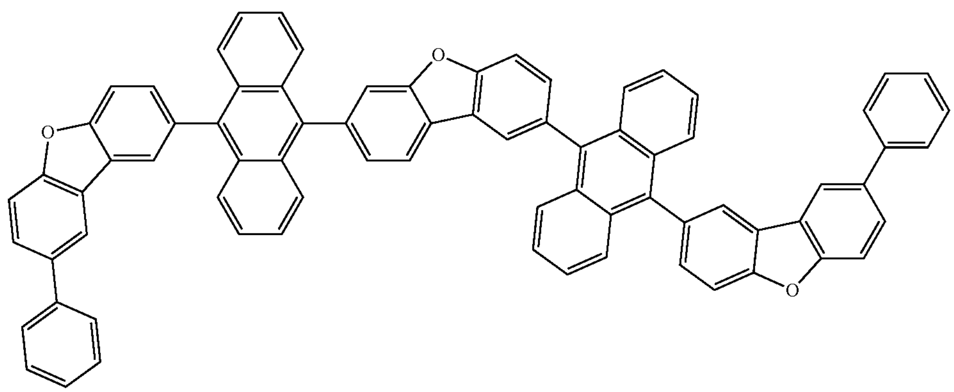
369
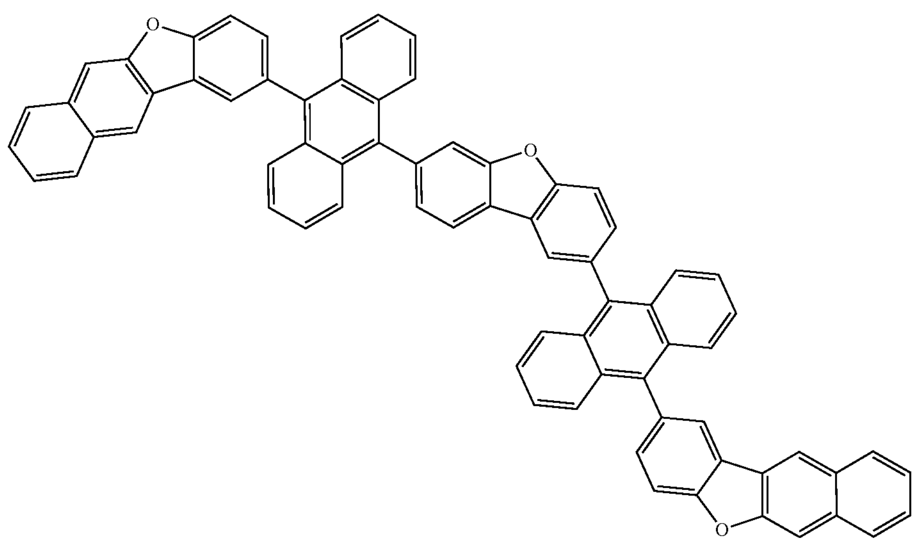

-continued
370
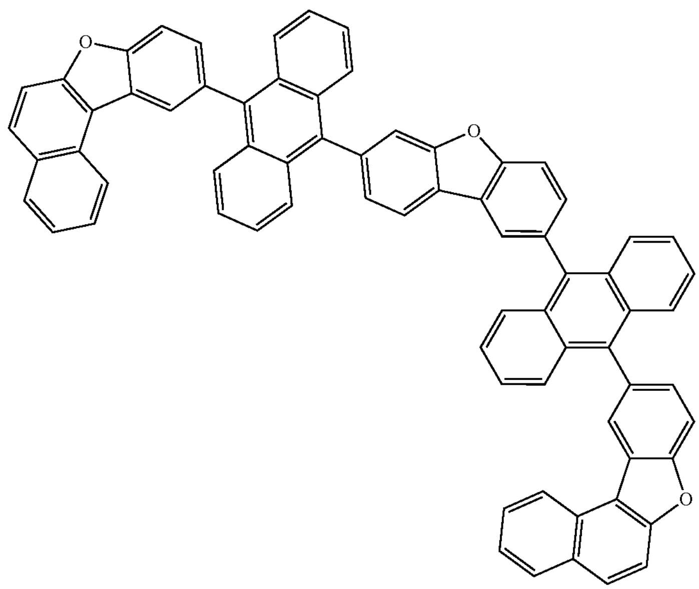
371
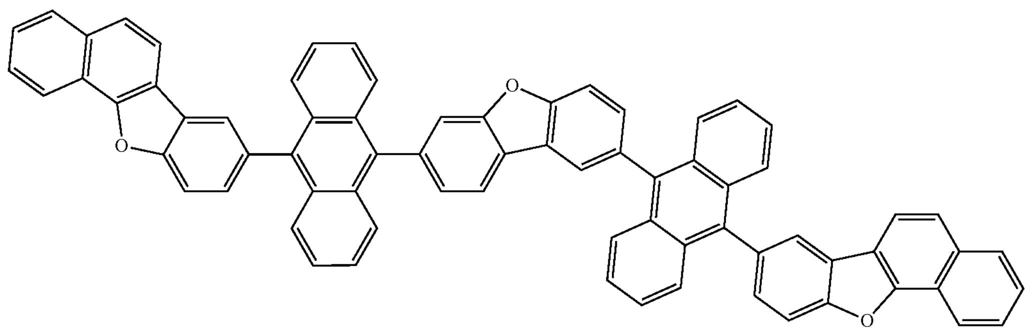
372
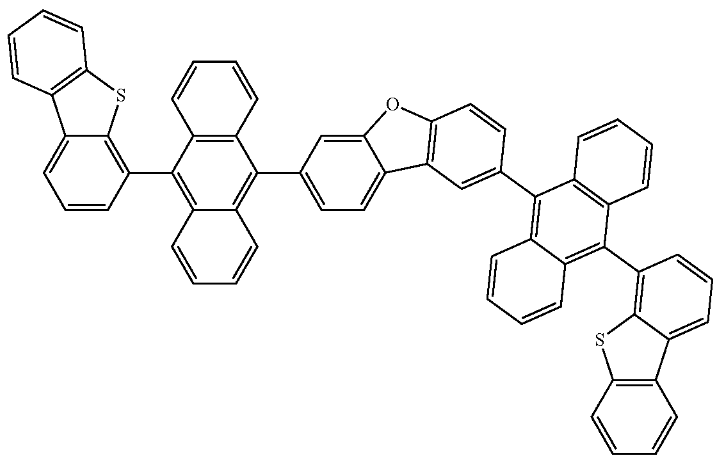

-continued
373
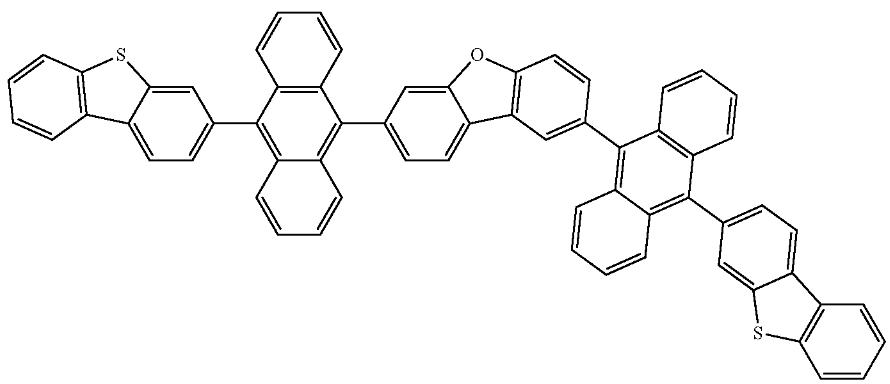
374
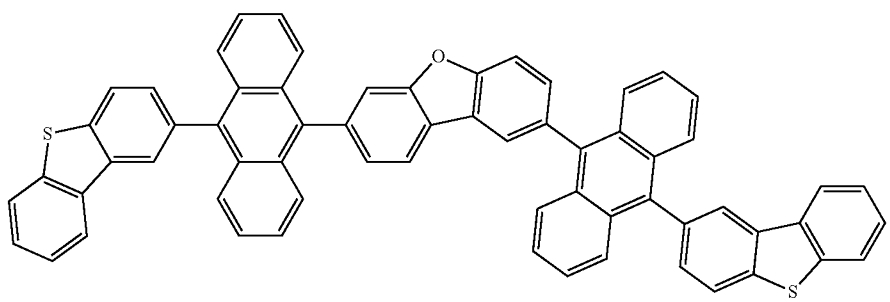
375
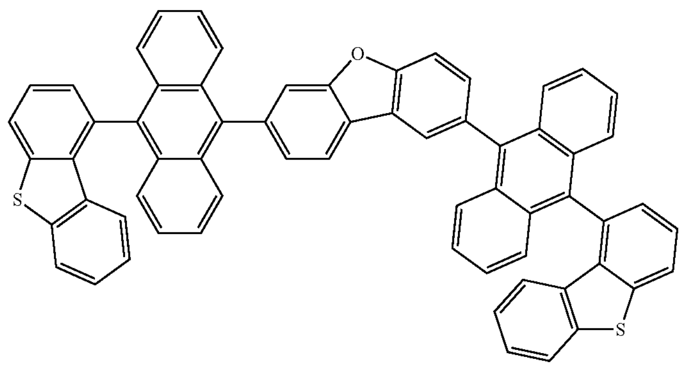
376
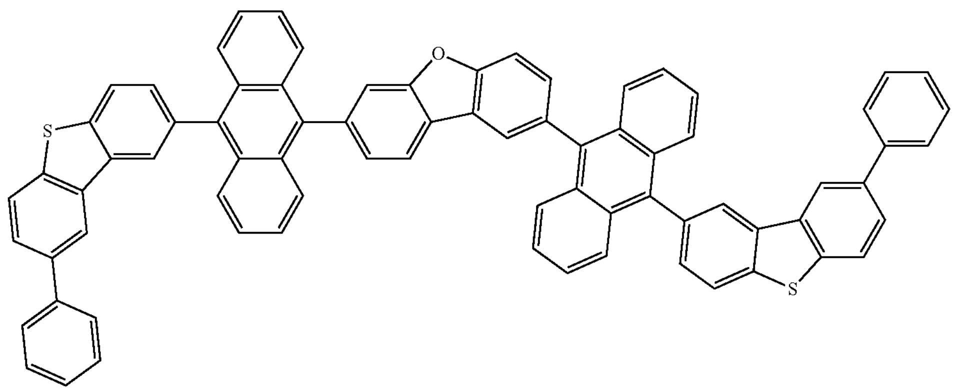

-continued
377
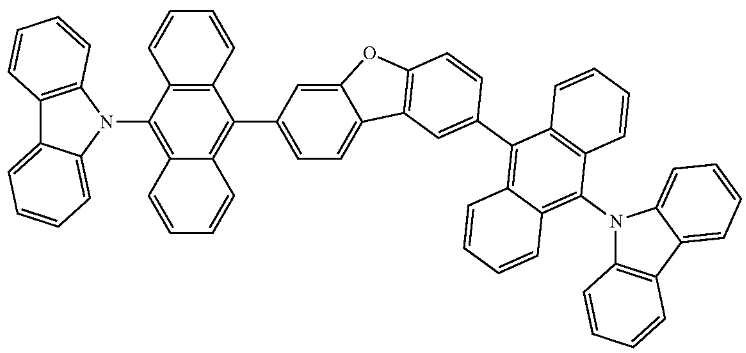
378
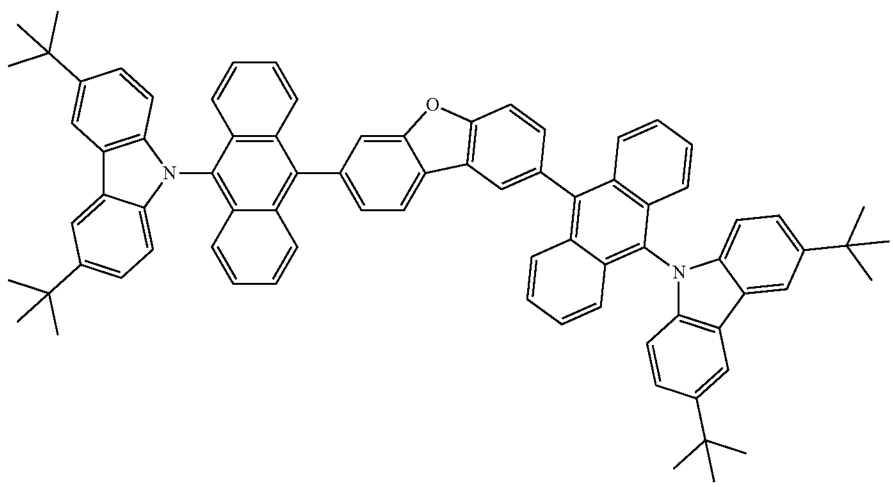
379
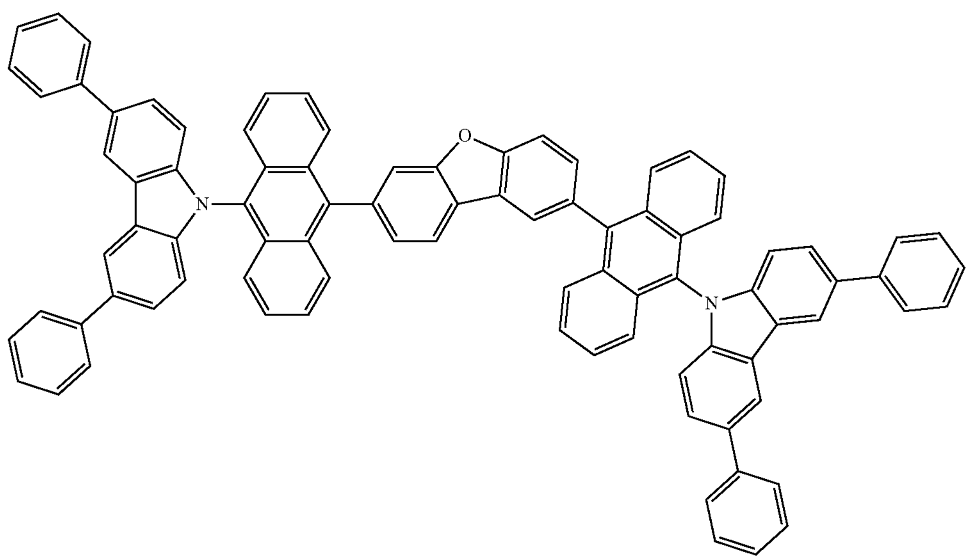

-continued
380
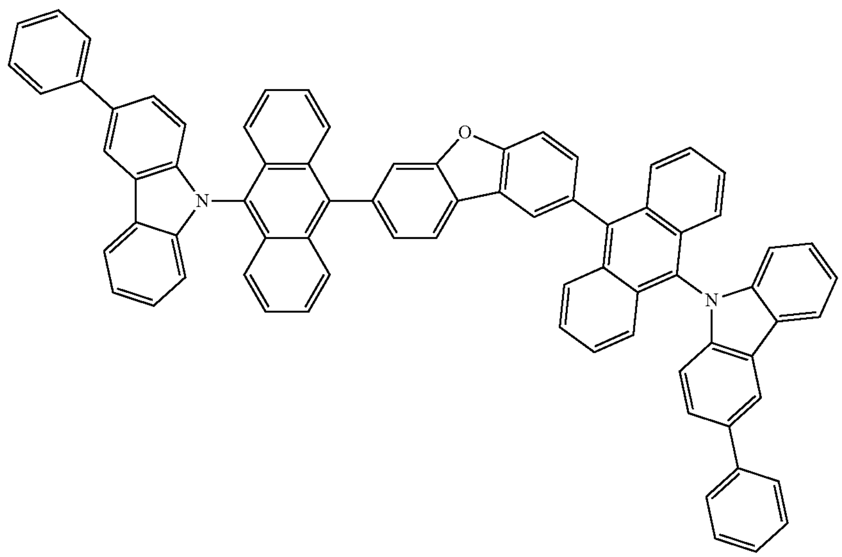
381
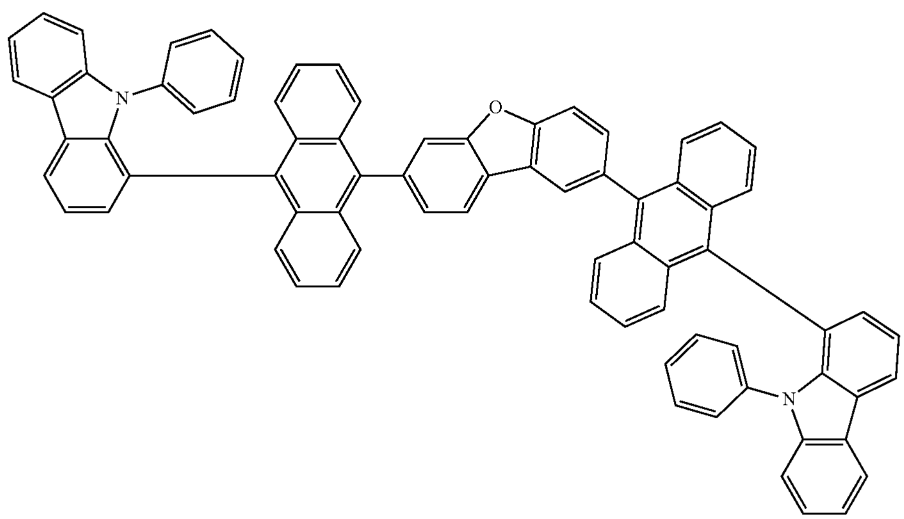
382
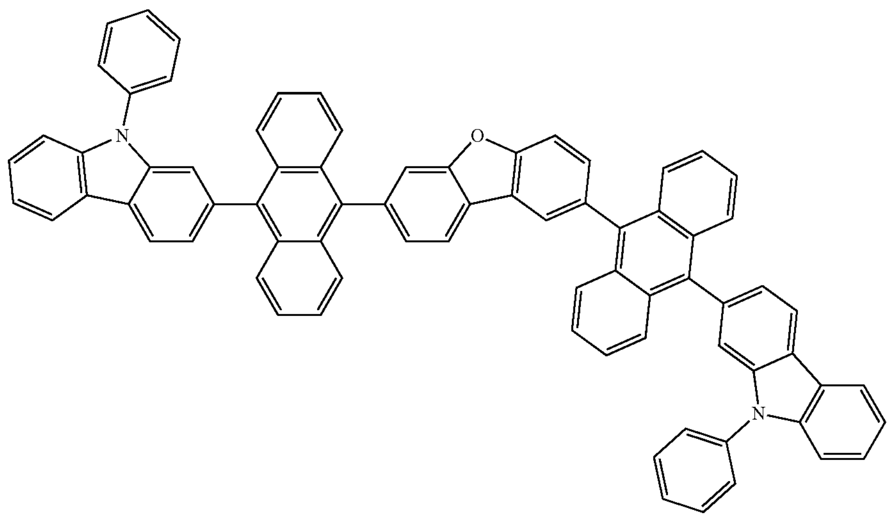

-continued
383
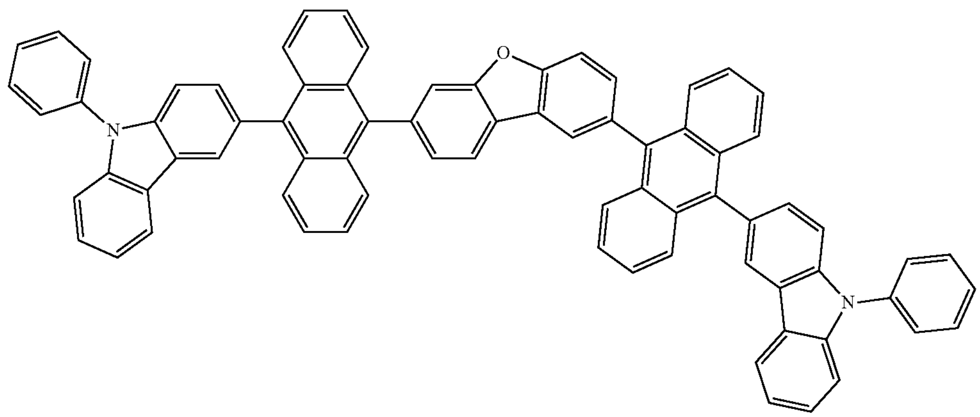
384
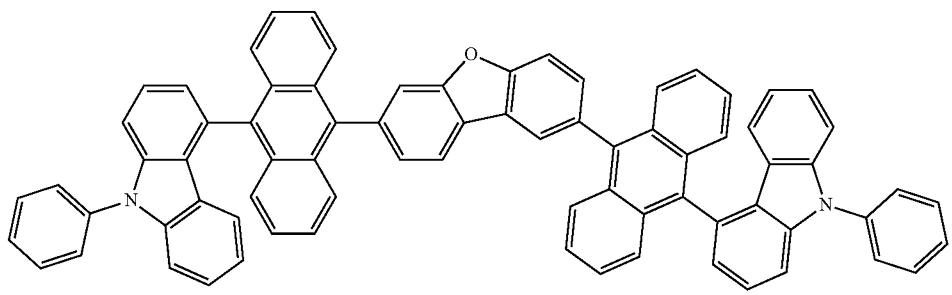
385
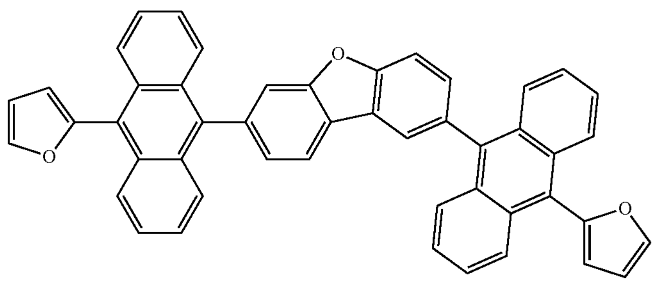
386
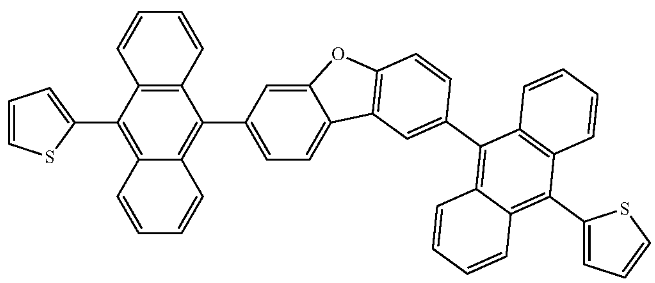
387
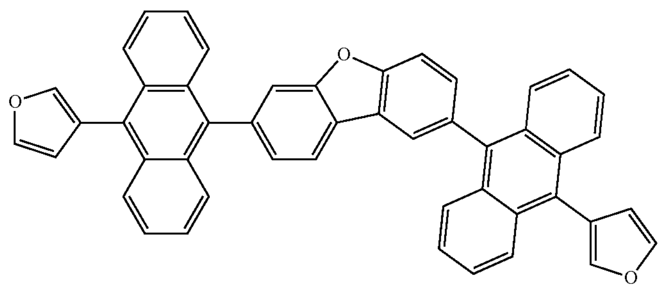

-continued
388
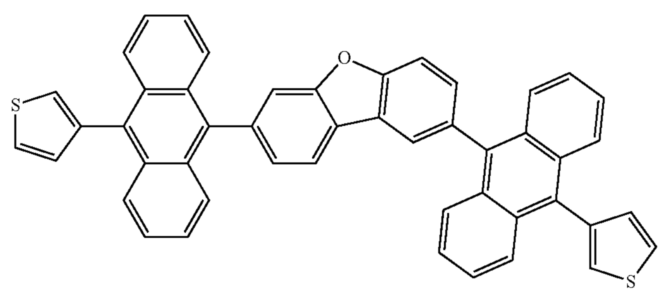
389
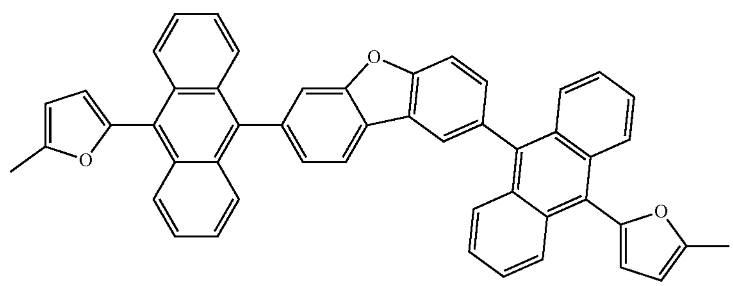
390
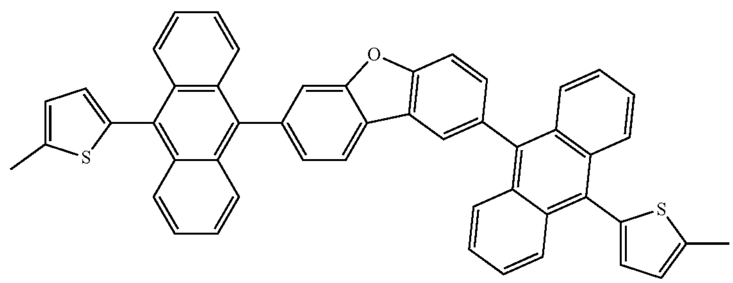
391
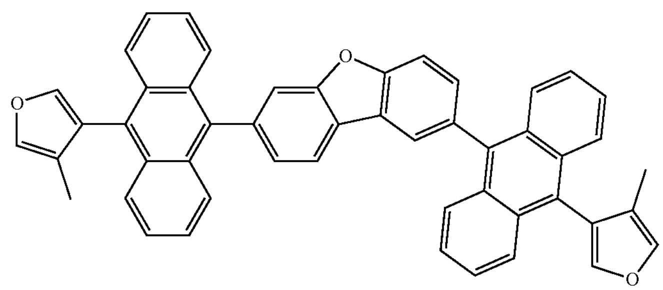
392
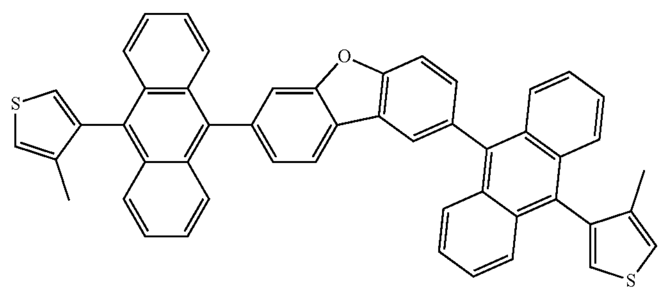

-continued
393
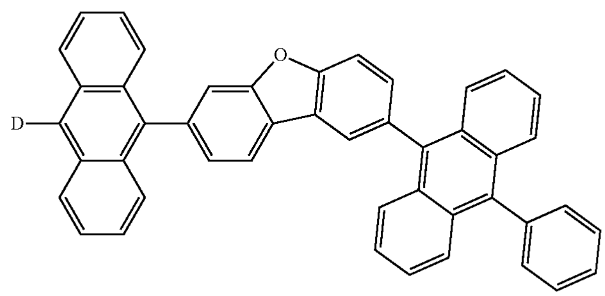
394
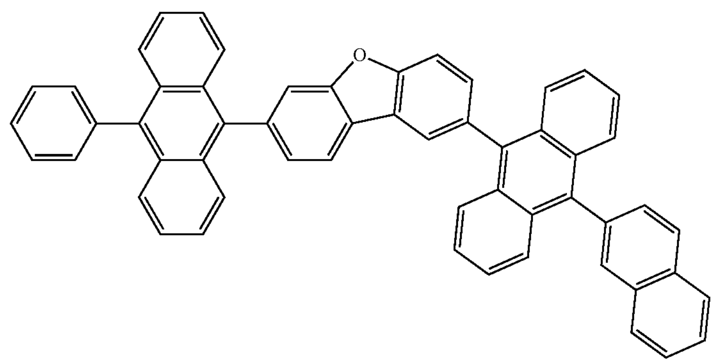
395
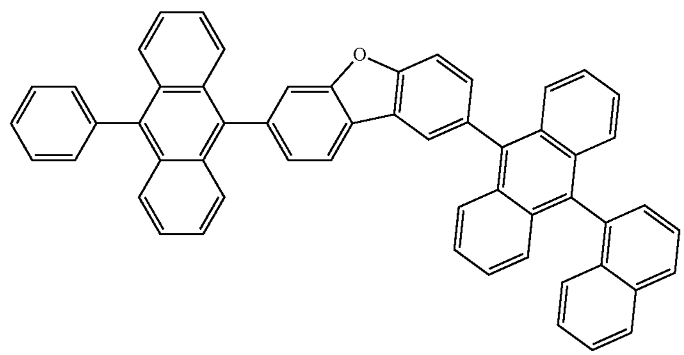
396
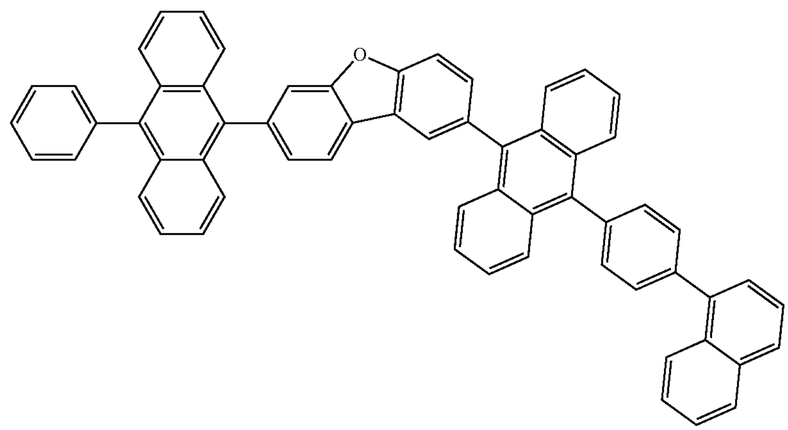

-continued
397
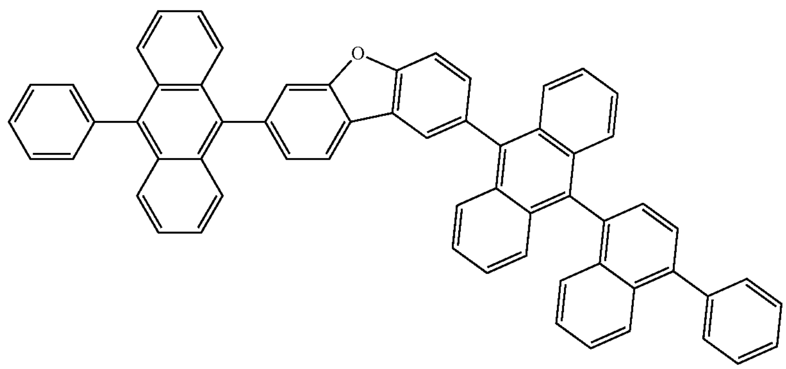
398
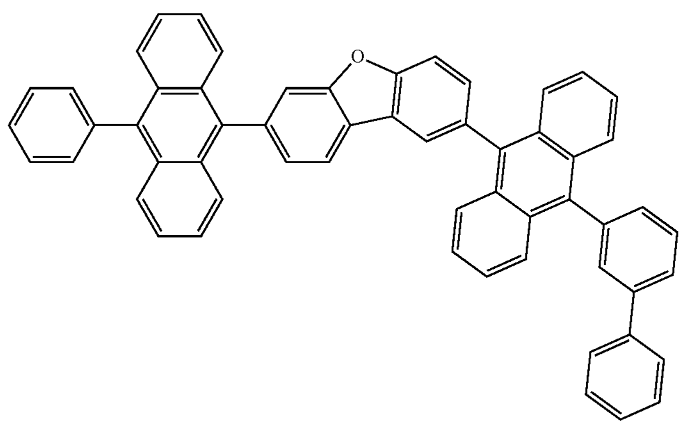
399
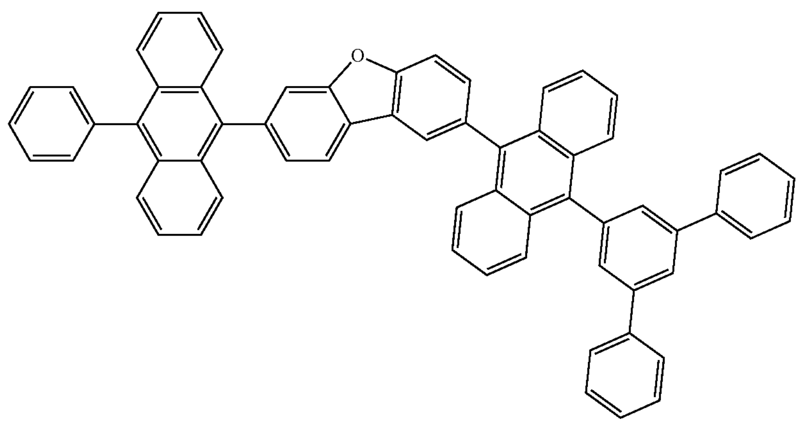
400
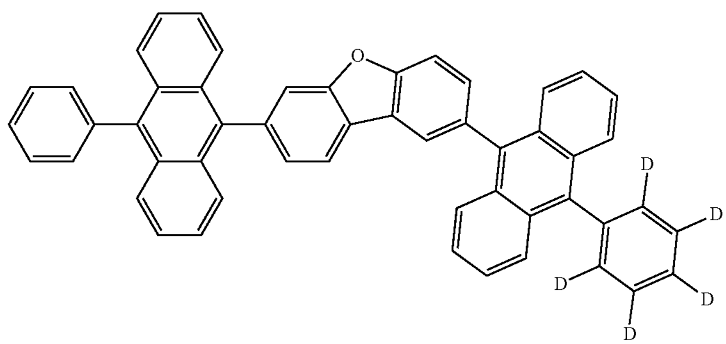

401
402
403
404
405
406
407
408
409
410
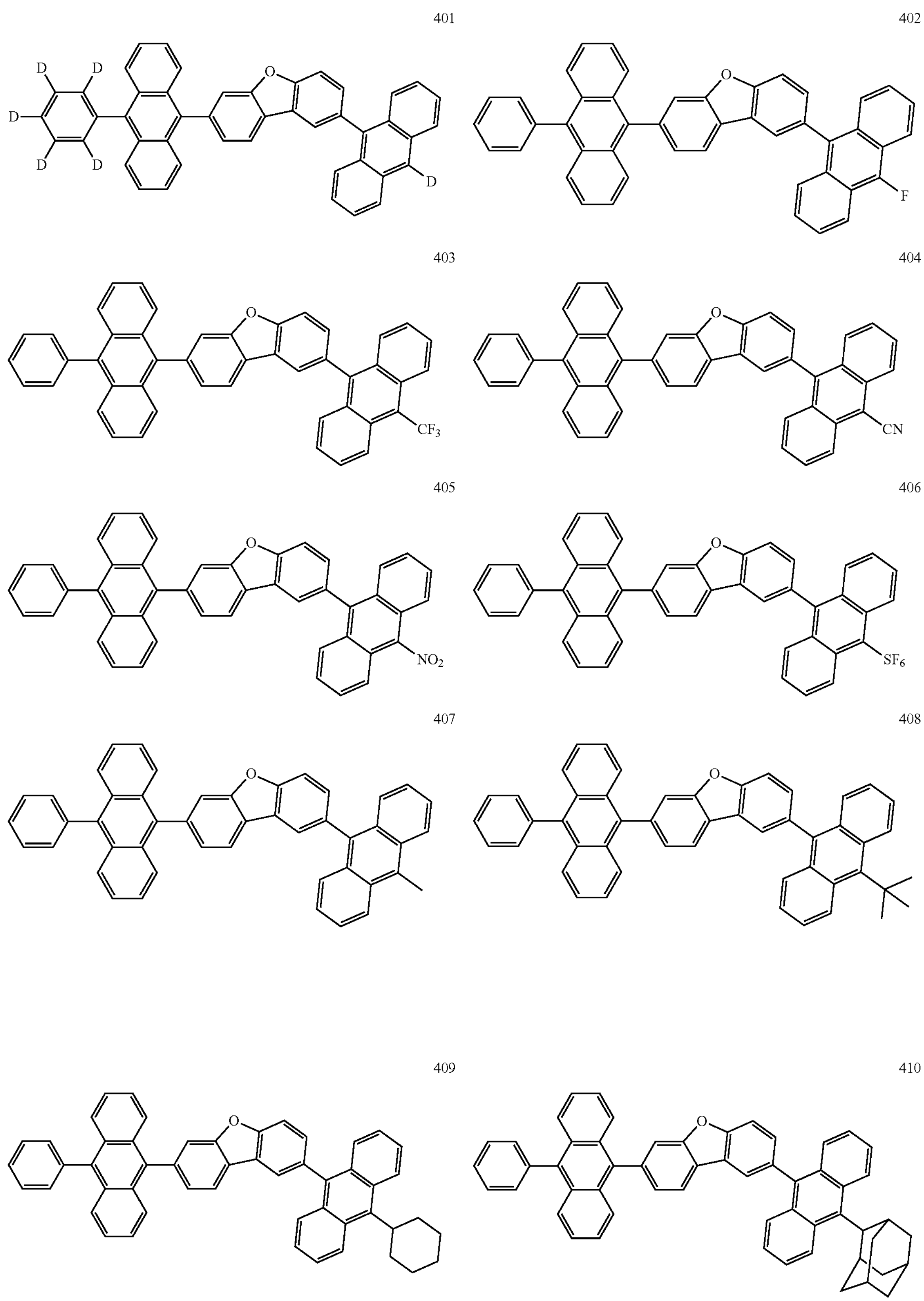

-continued
411
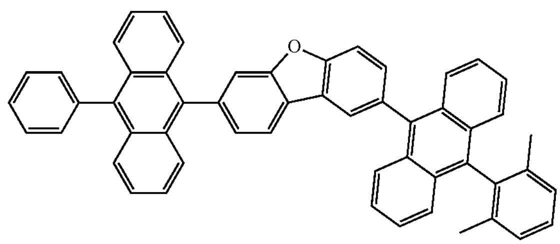
412
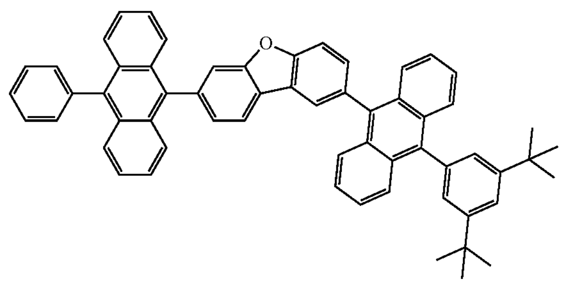
413
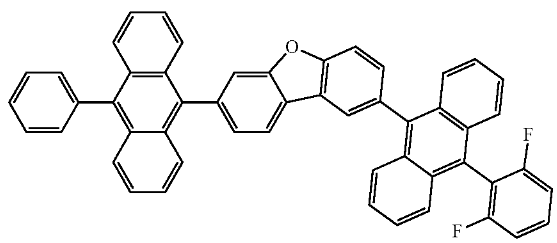
414
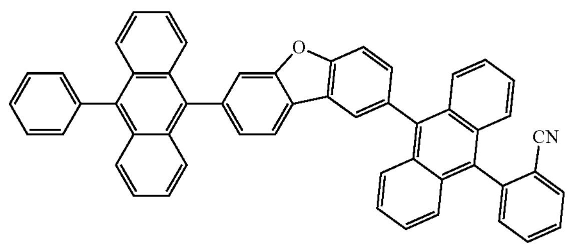
415
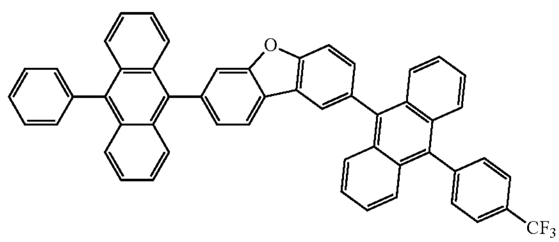
416
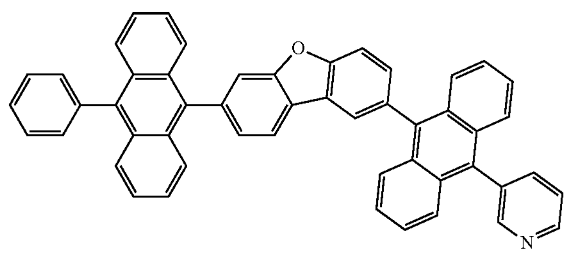
417
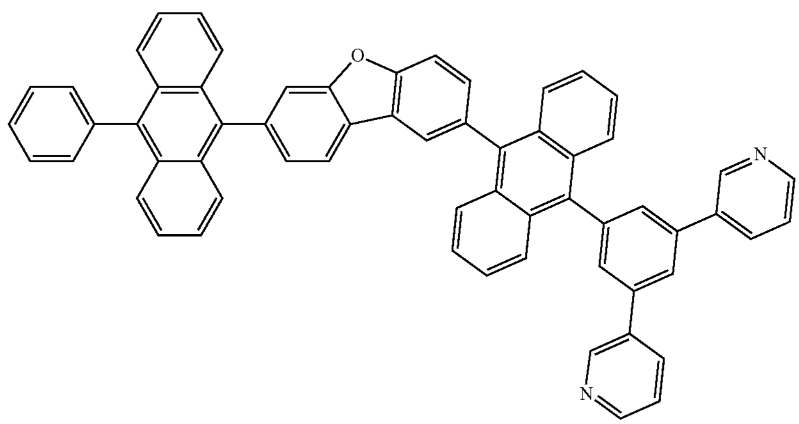

-continued
418
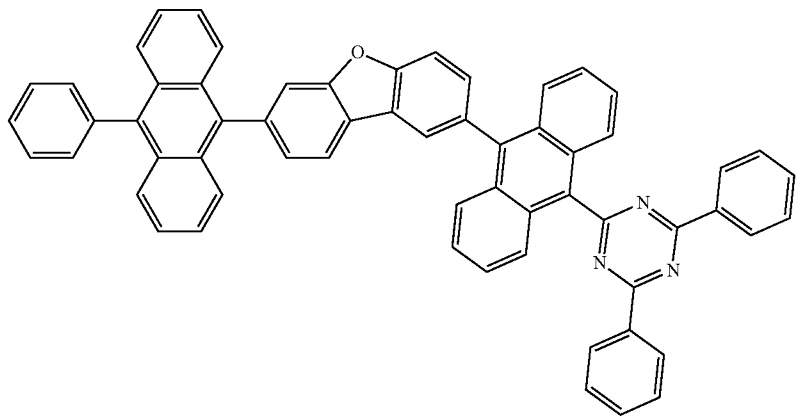
419
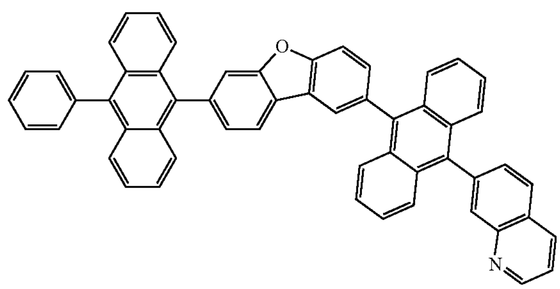
420
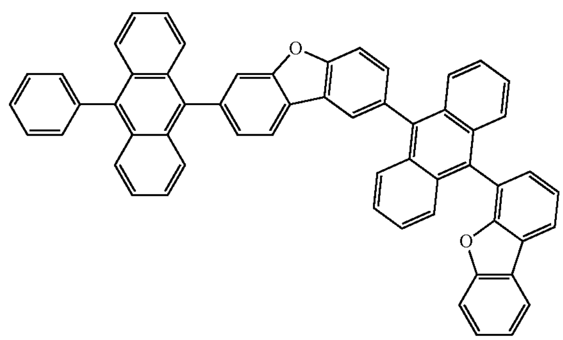
421
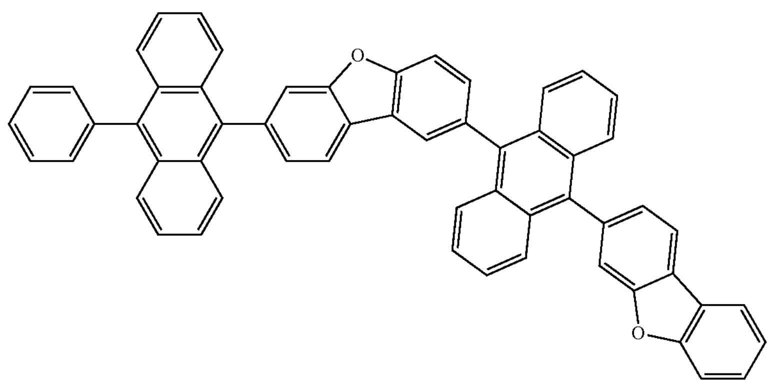
422
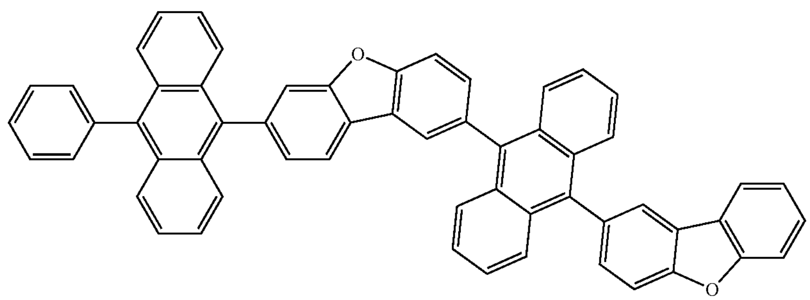

-continued
423
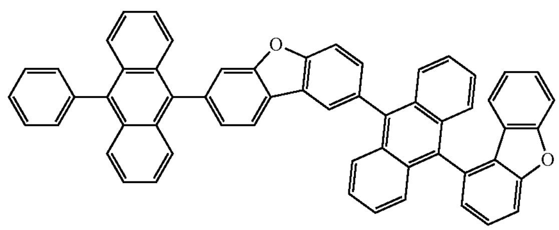
424
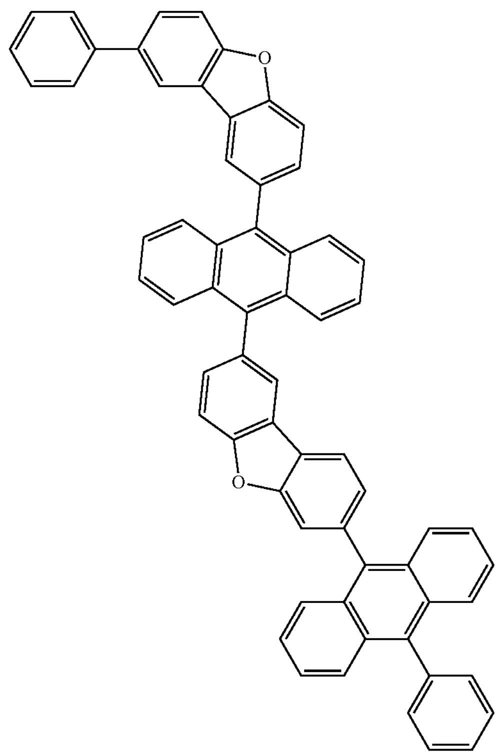
425
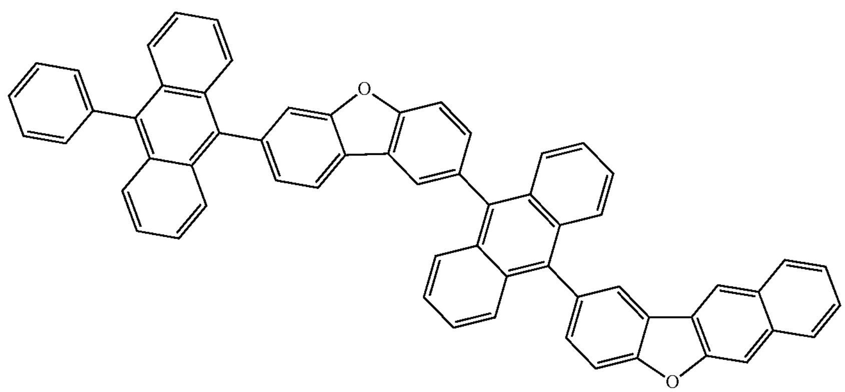
426
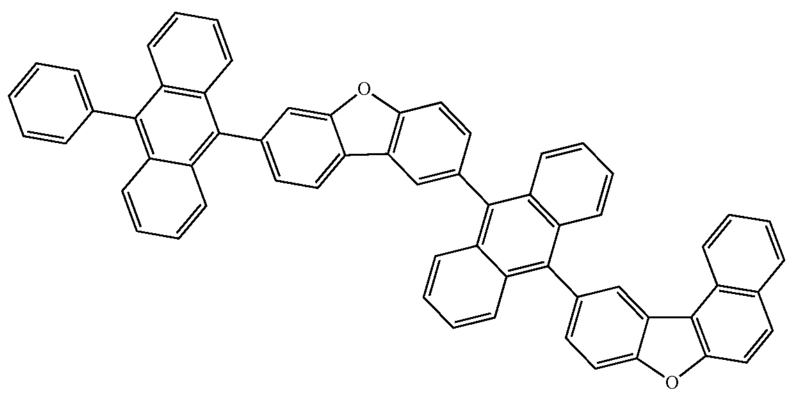

-continued
427
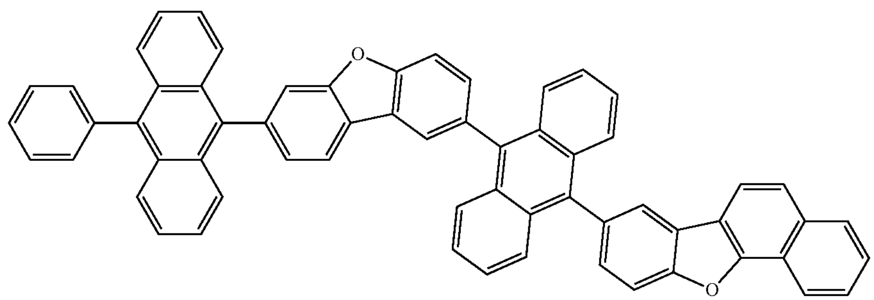
428
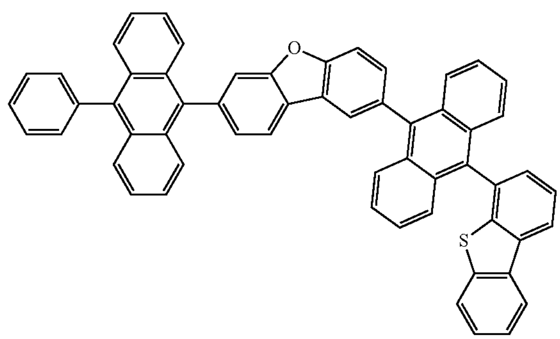
429
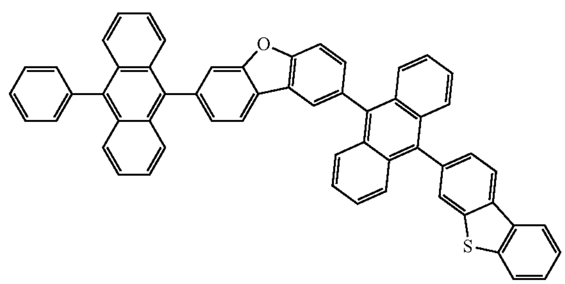
430
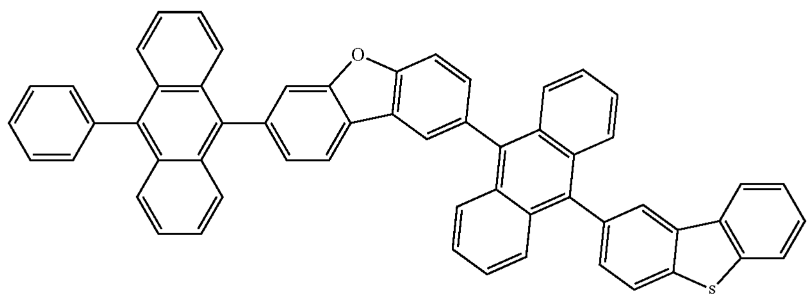

-continued
431
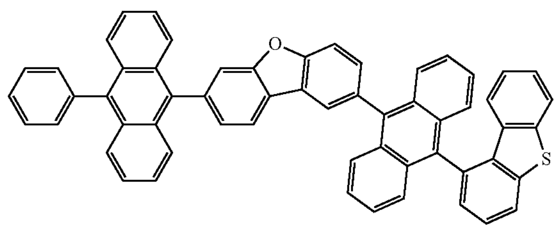
432
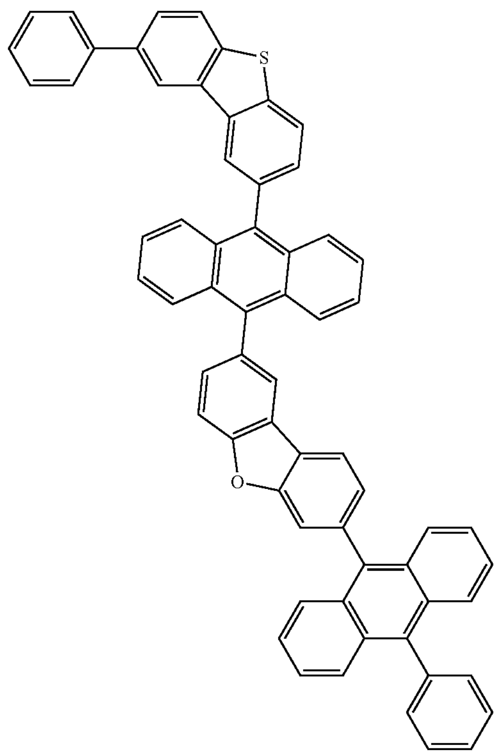
433
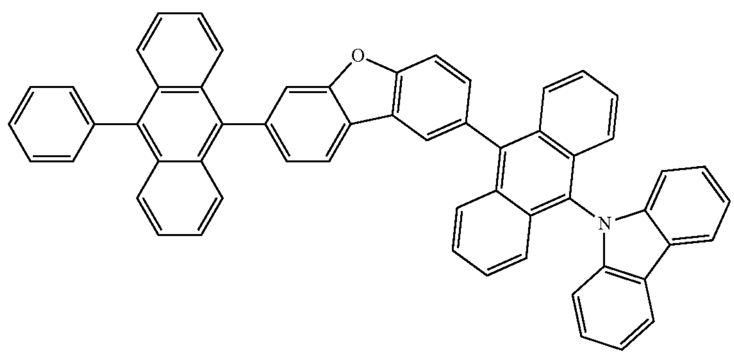
434
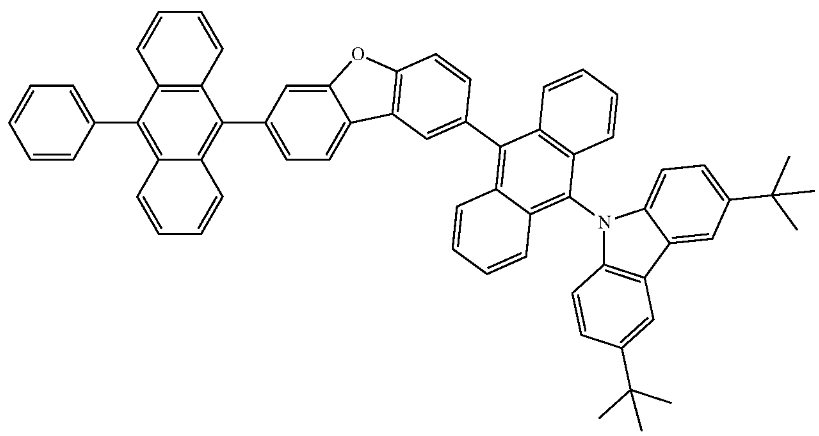

-continued
435
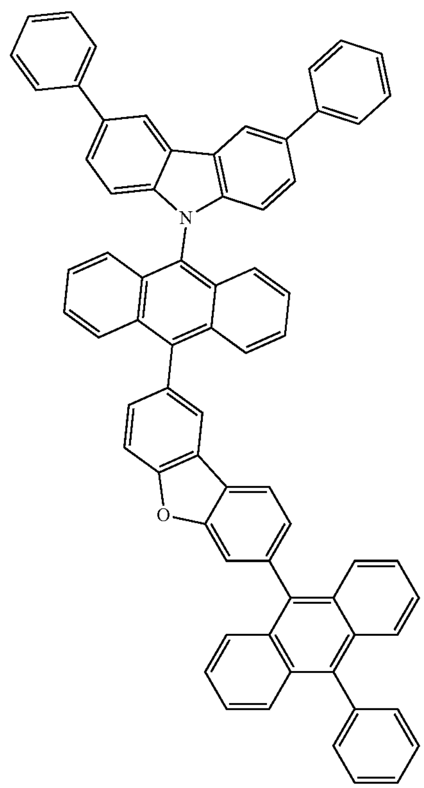
436
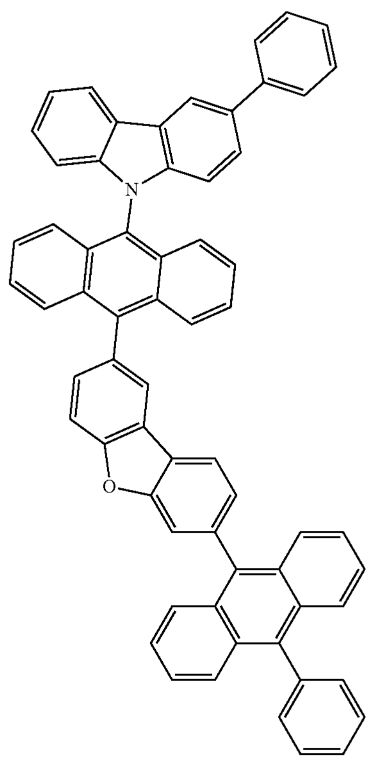
437
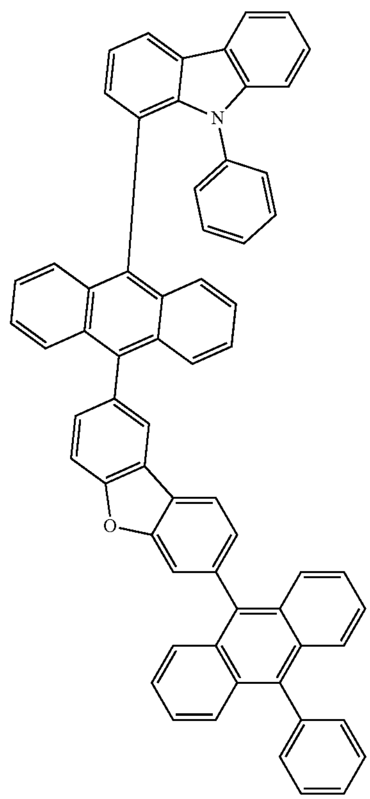
438
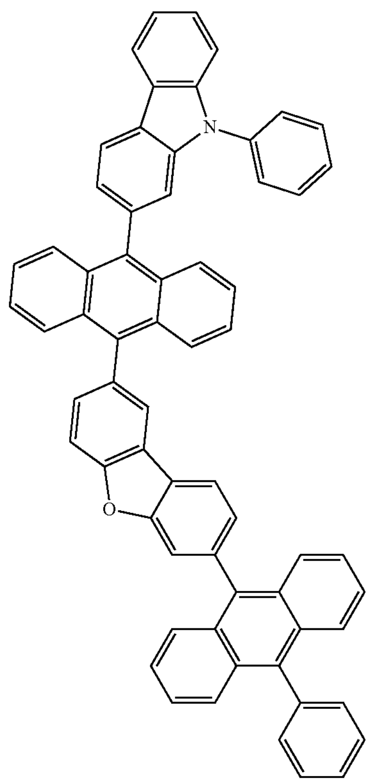

-continued
439
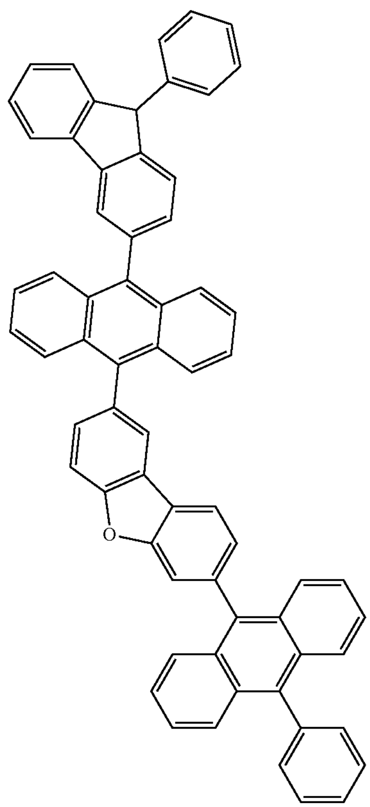
440
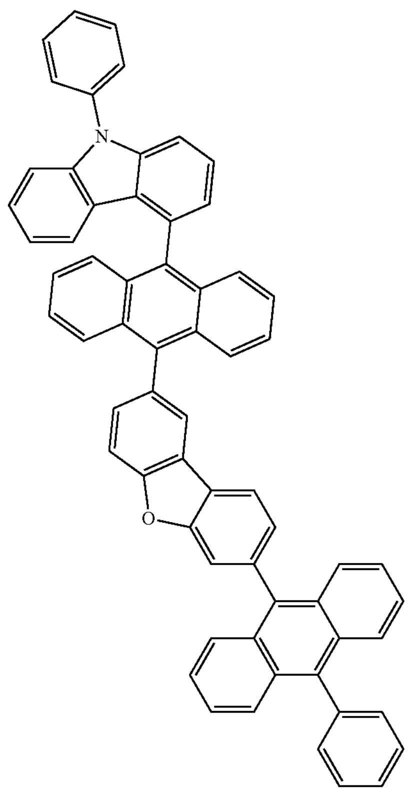
441
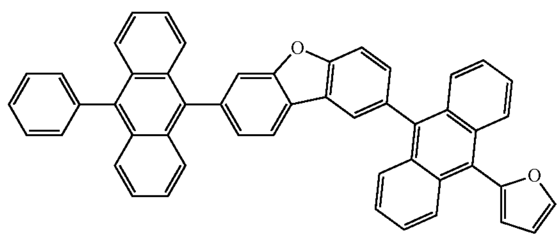
442
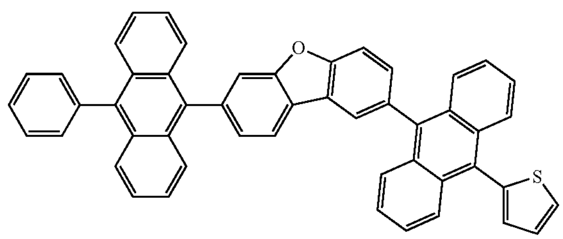
443
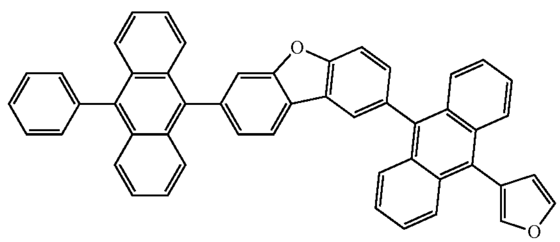
444
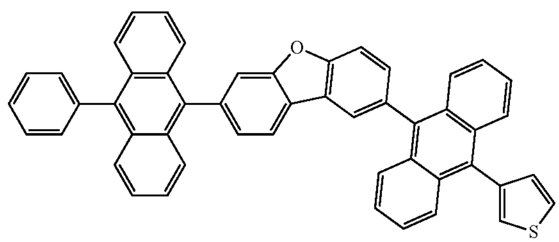
445
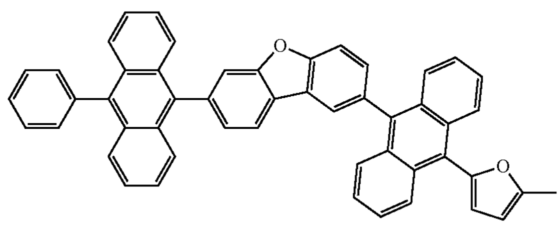
446
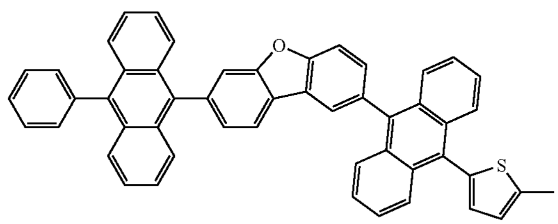

-continued
447
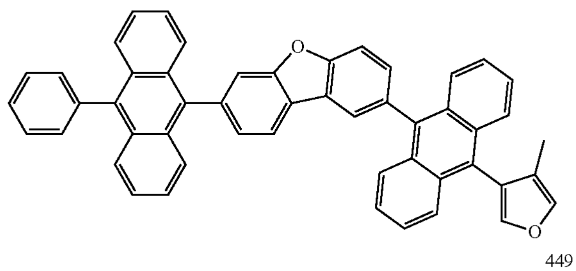
448
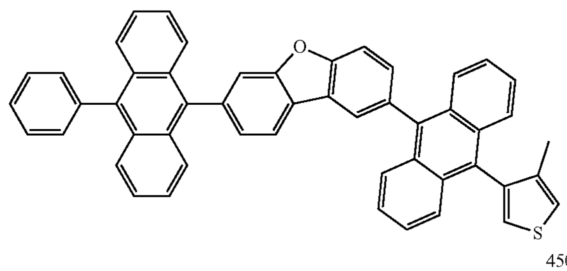
449
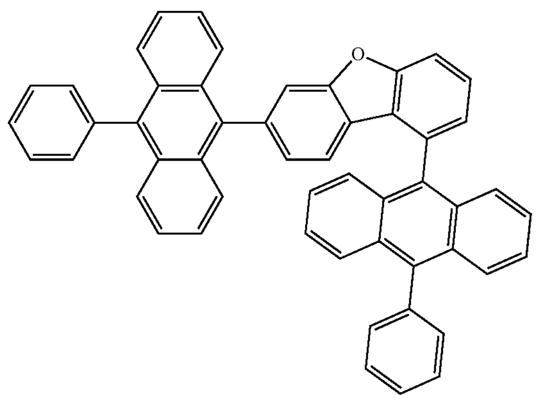
450
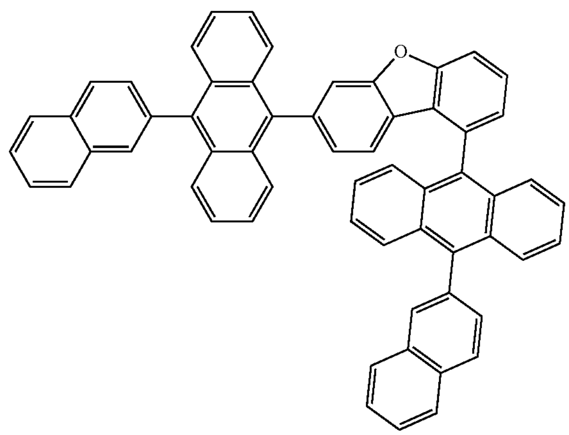
451
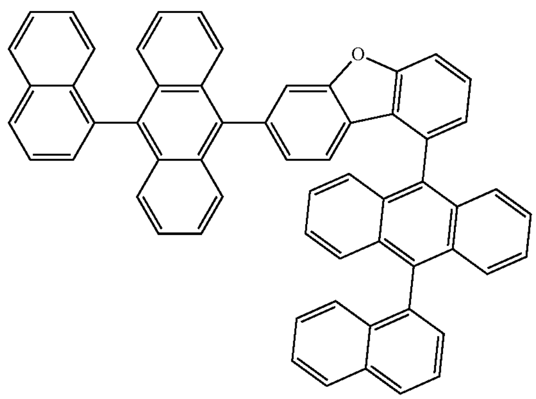
452
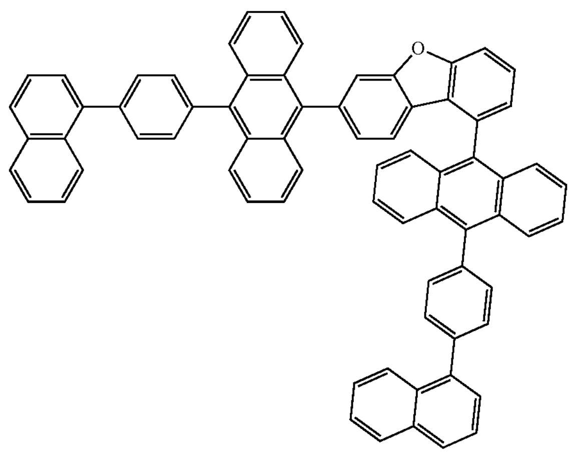
453
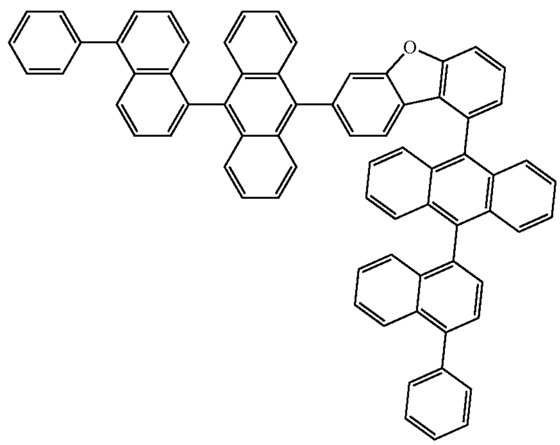
454
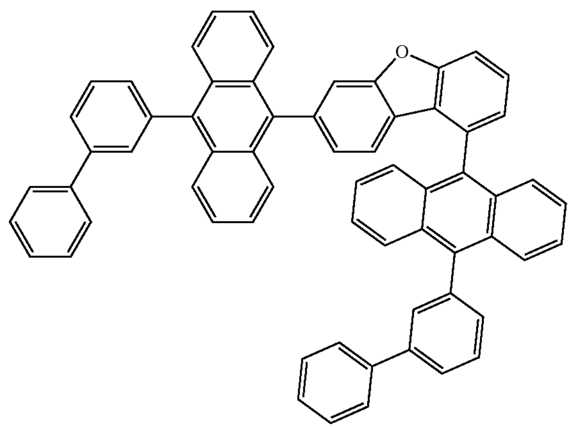

-continued
455
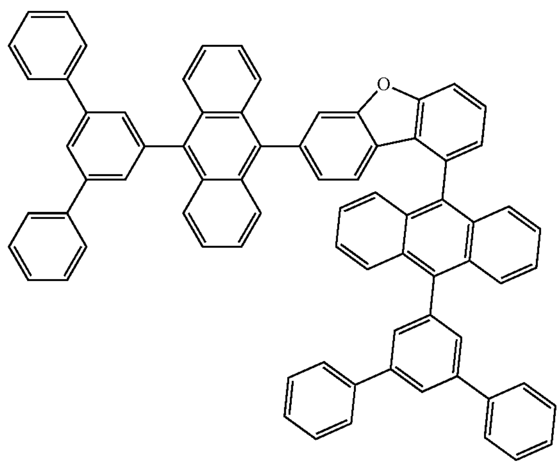
456
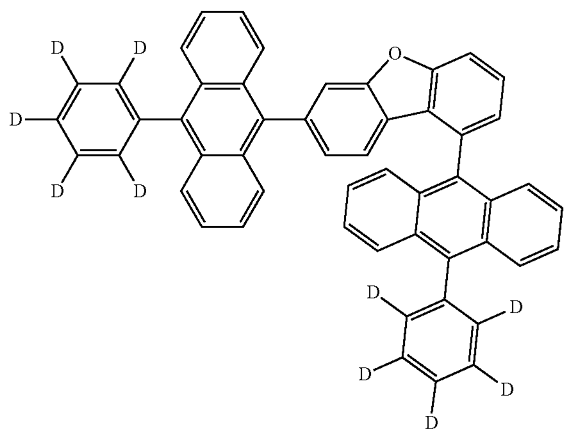
457
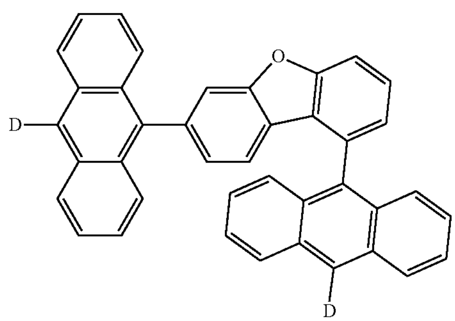
458
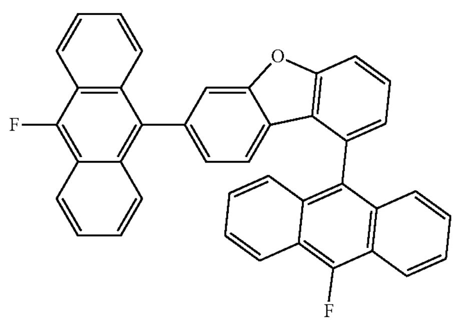
459
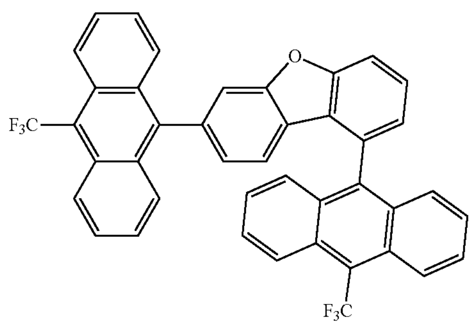
460
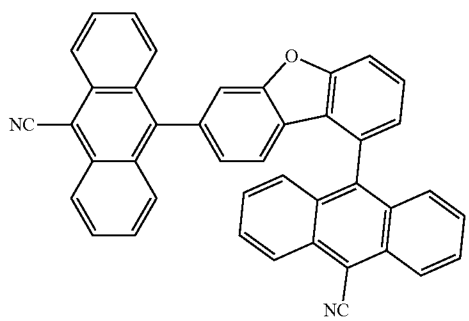
461
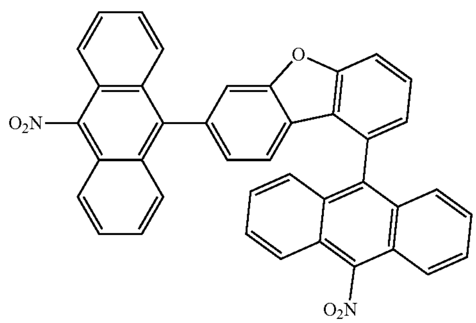
462
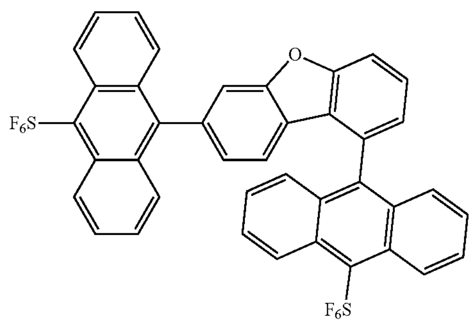

-continued
463
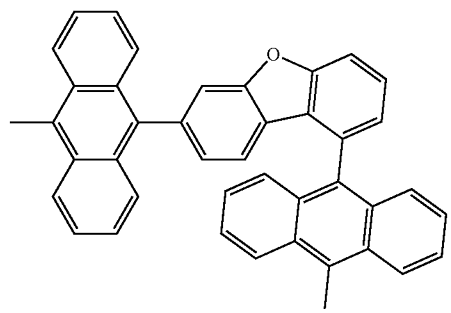
464
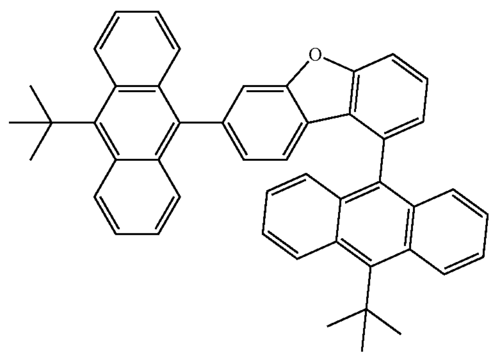
465
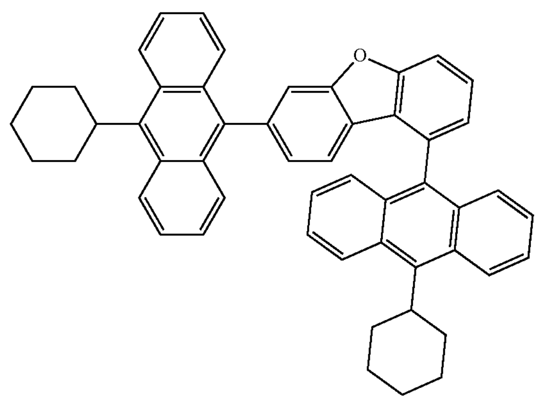
466
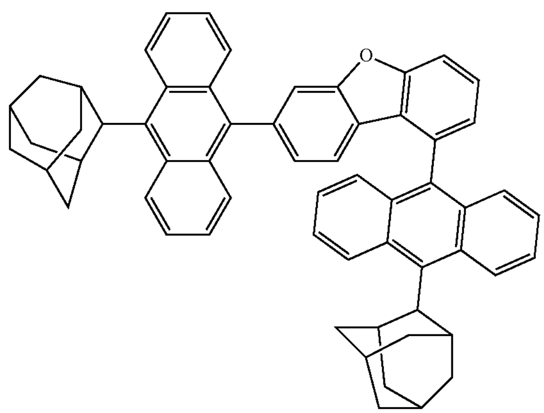
467
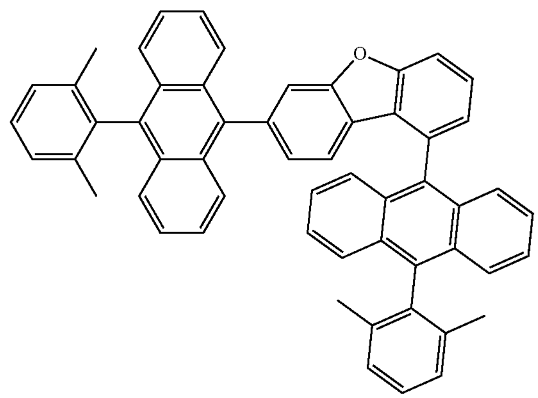
468
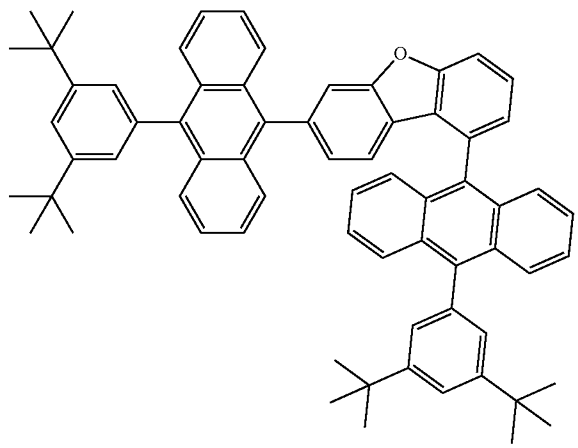

-continued
469
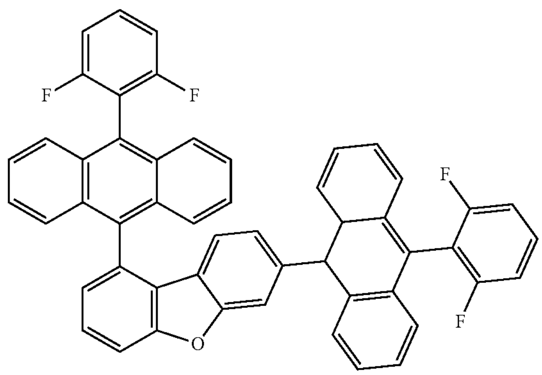
470
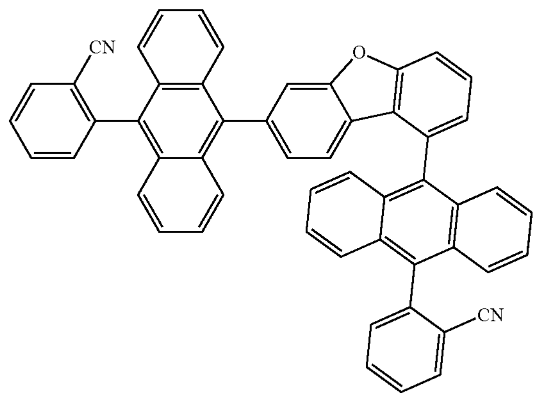
471
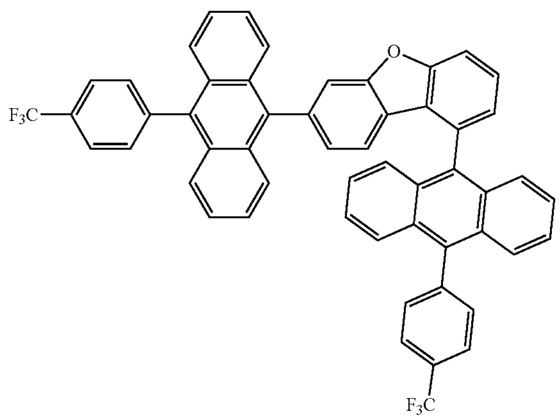
472
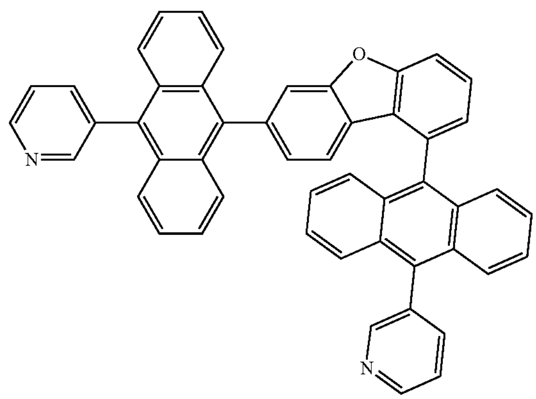
473
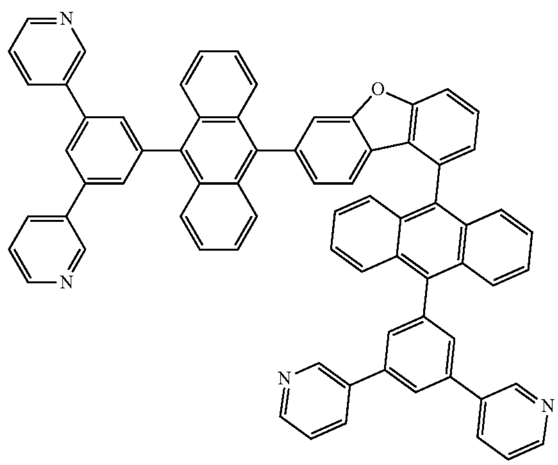
474
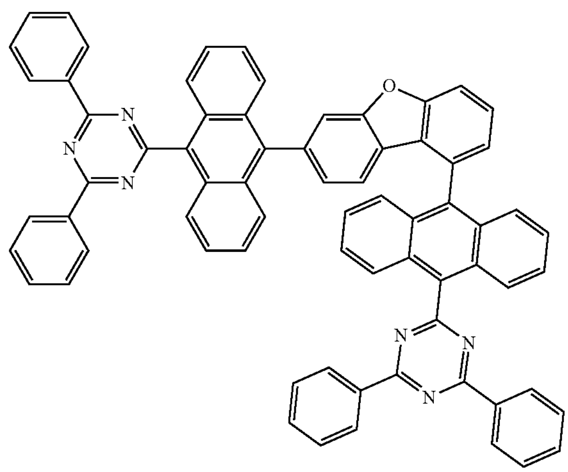

-continued
475
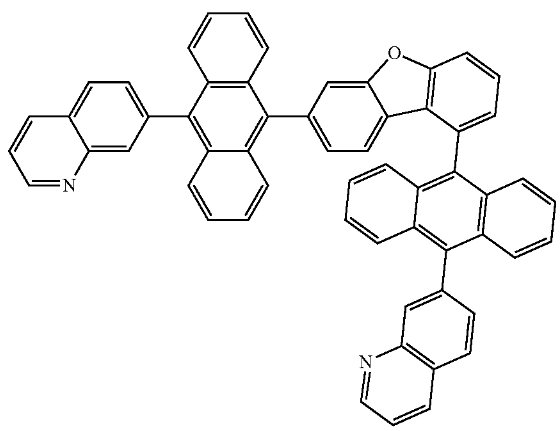
476
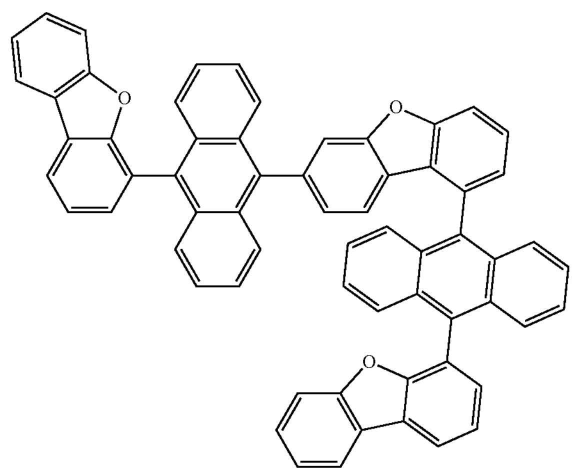
477
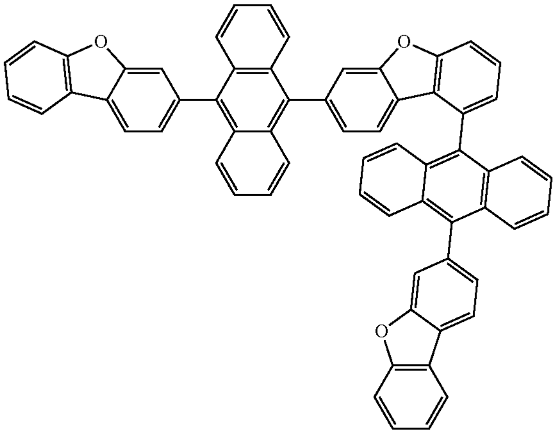
478
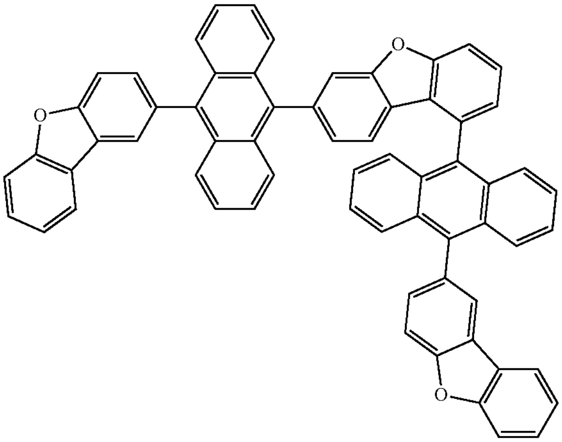
479
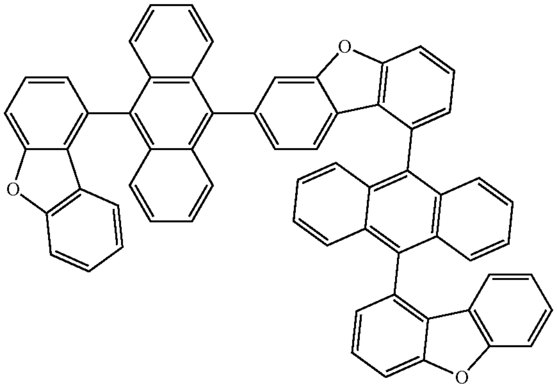
480
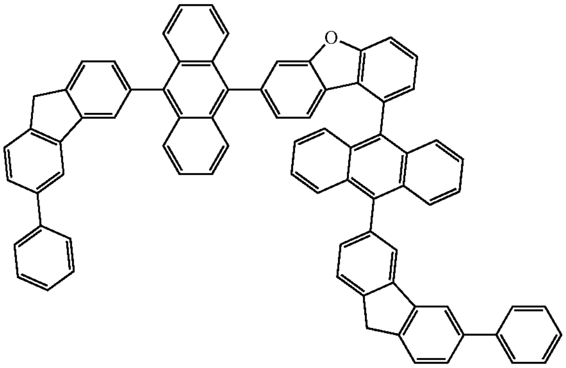

-continued
481
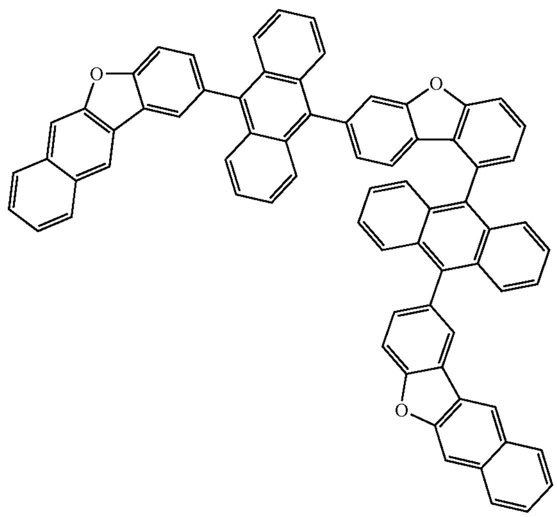
482
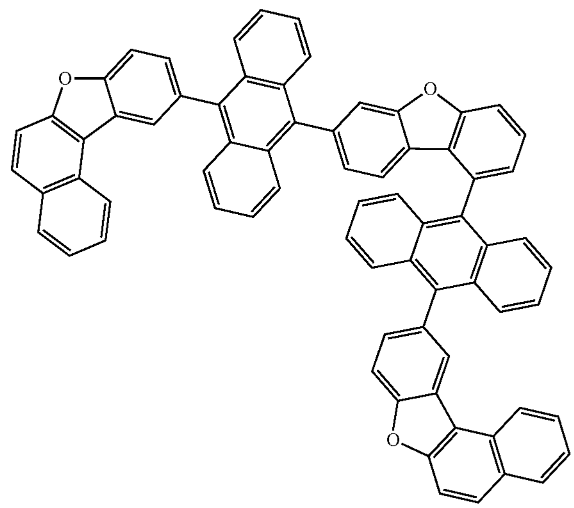
483
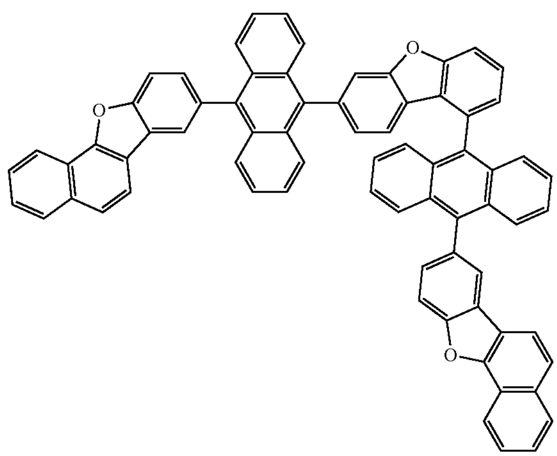
484
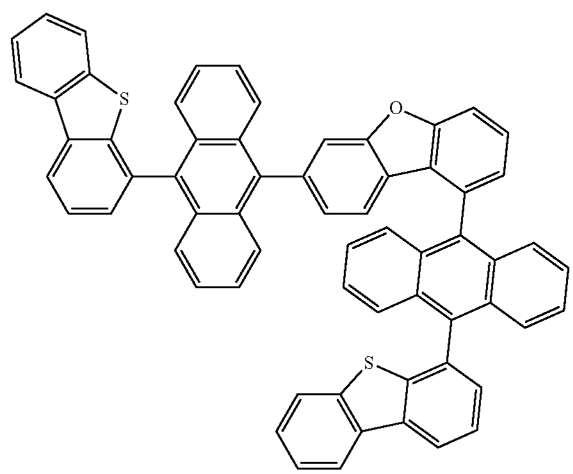
485
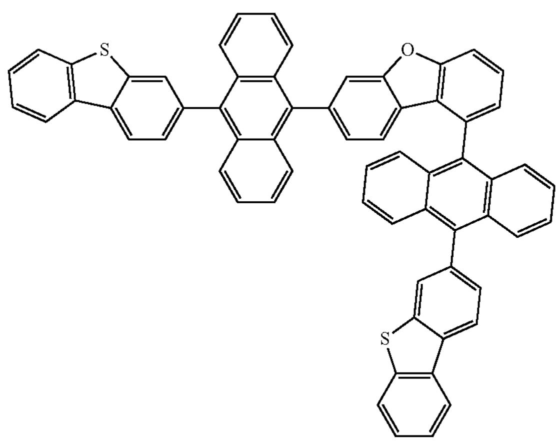
486
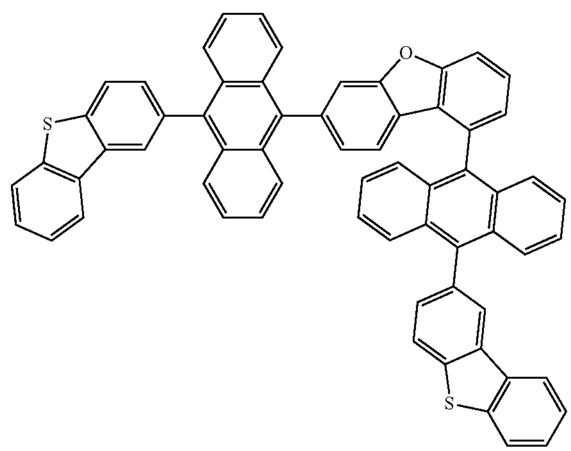

-continued
487
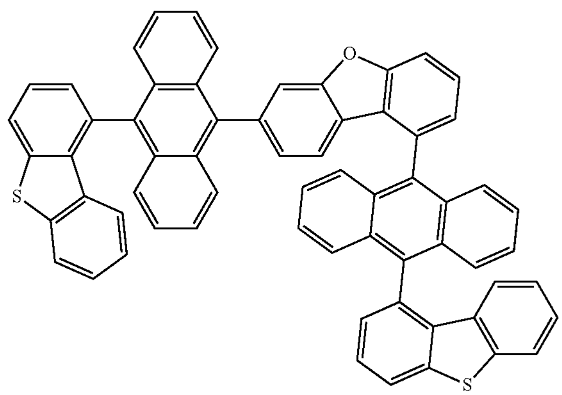
488
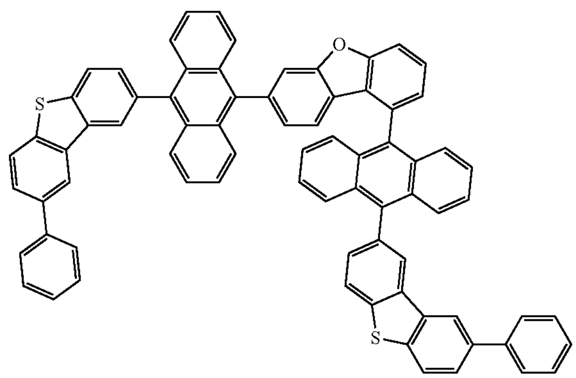
489
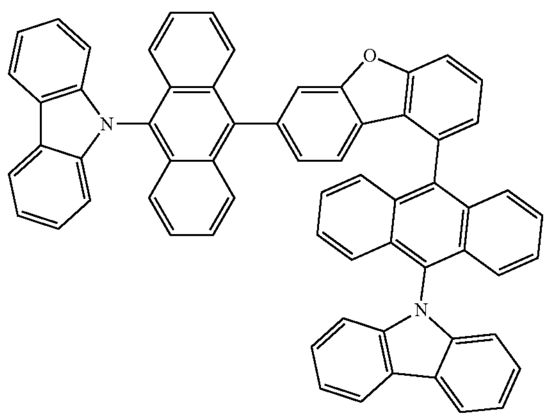
490
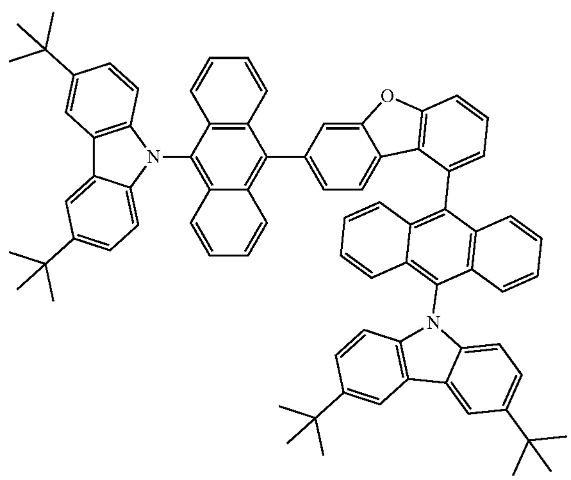
491
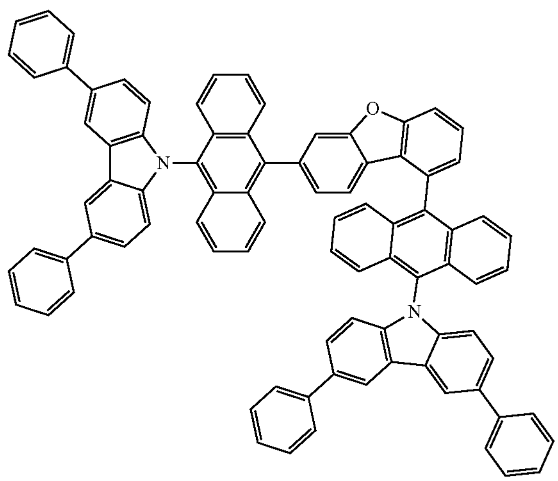
492
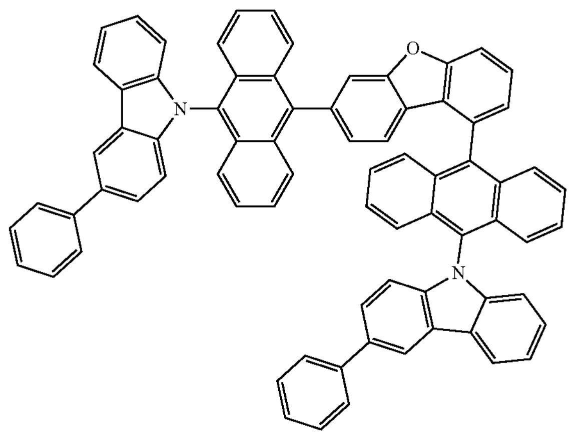

-continued
493
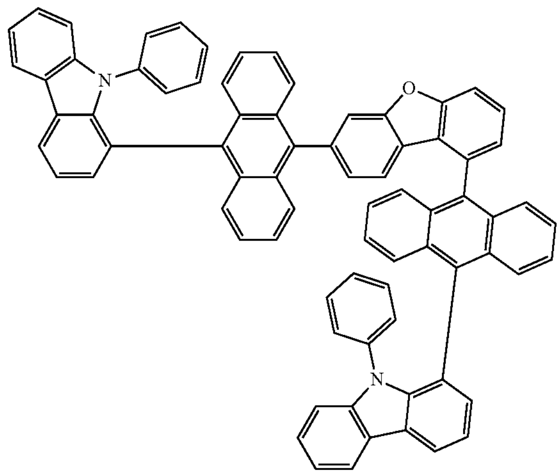
494
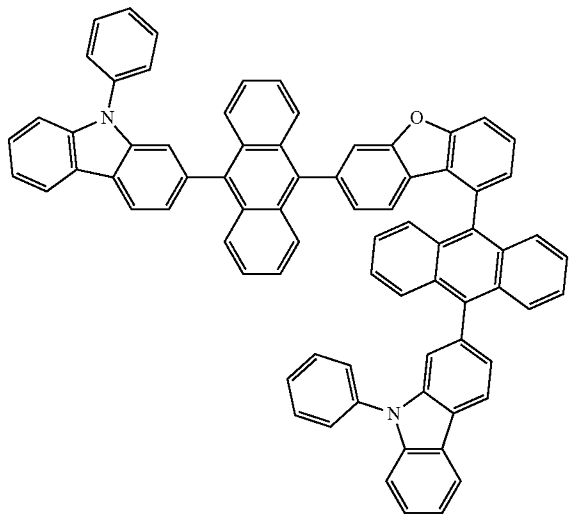
498
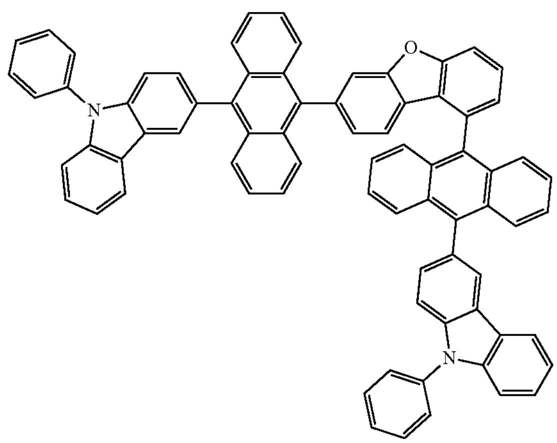
496
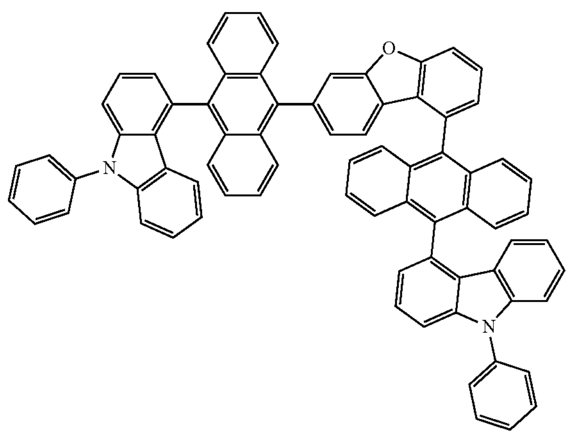
497
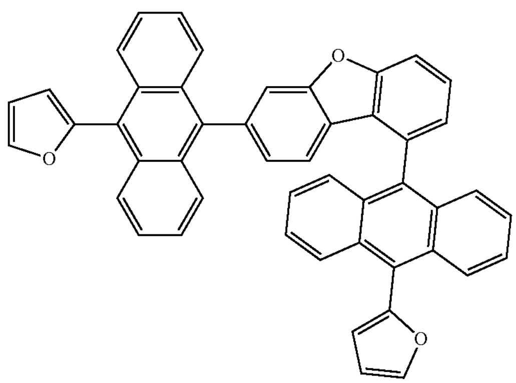
498
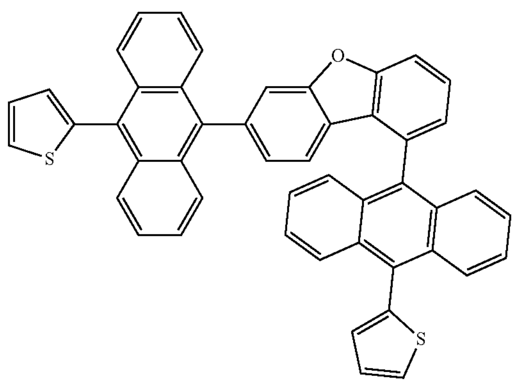

-continued
499
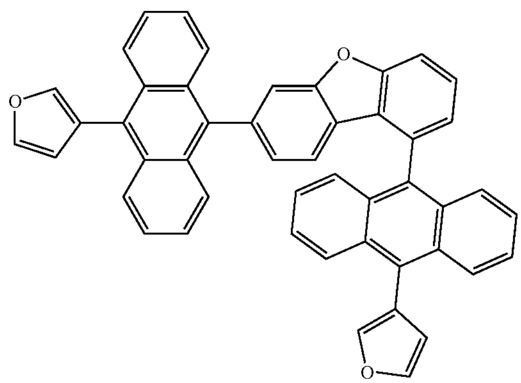
500
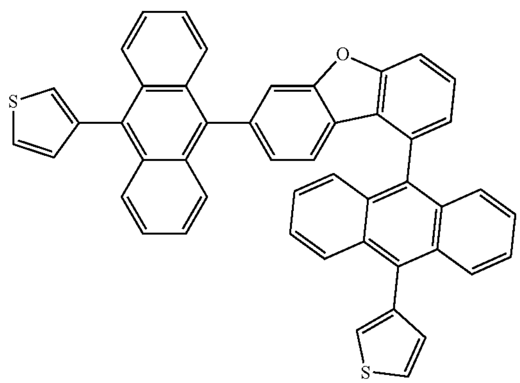
501
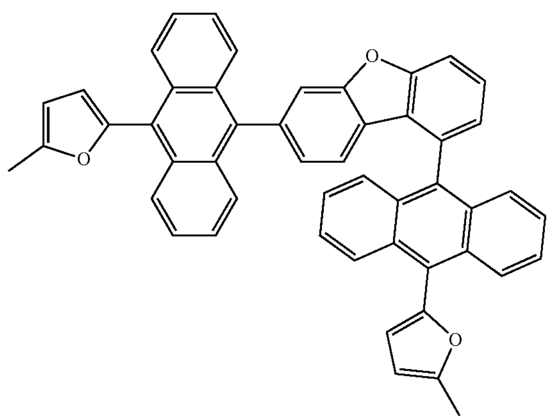
502
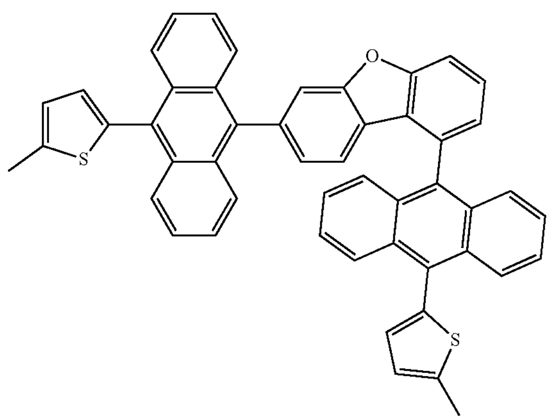
503
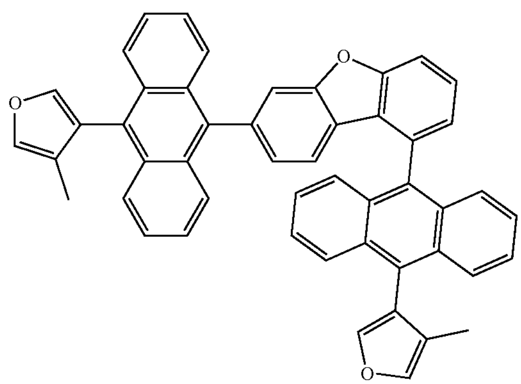
504
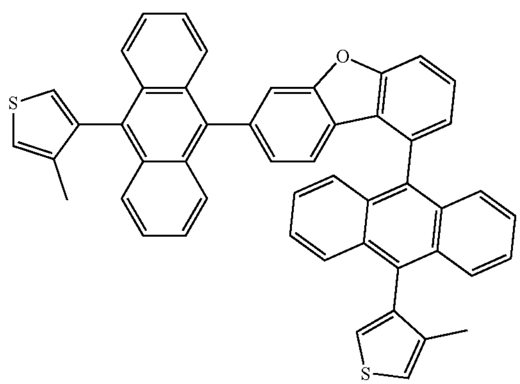

-continued
505
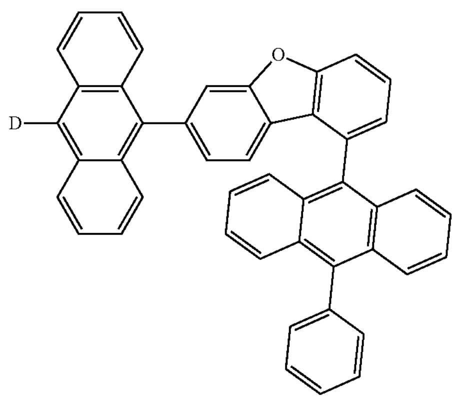
506
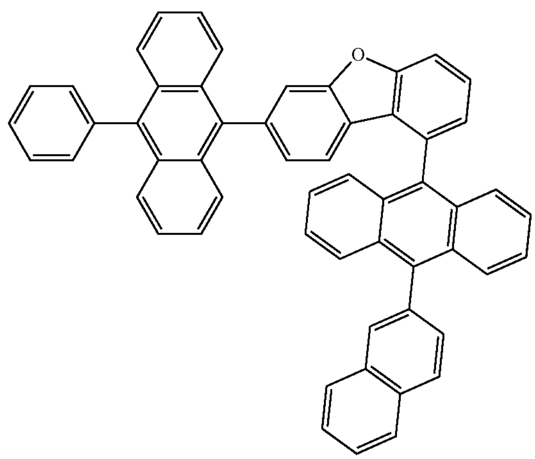
507
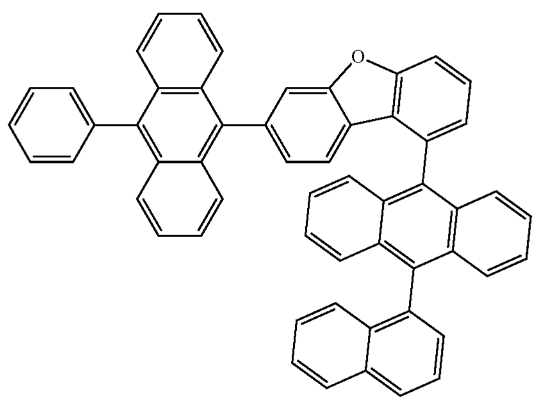
508
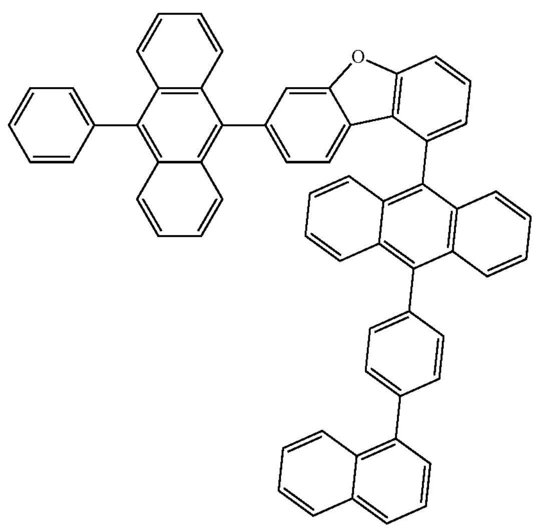
509
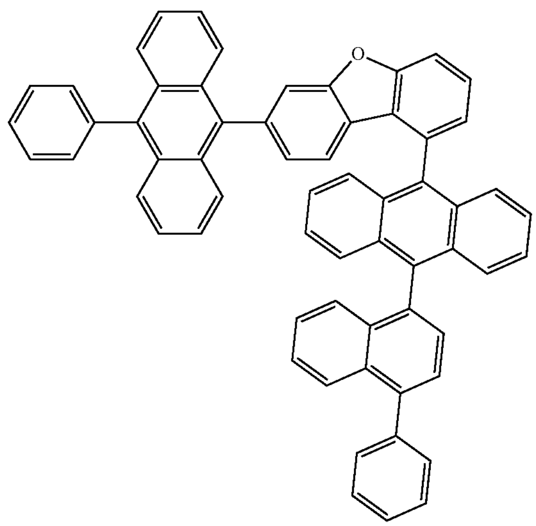
510
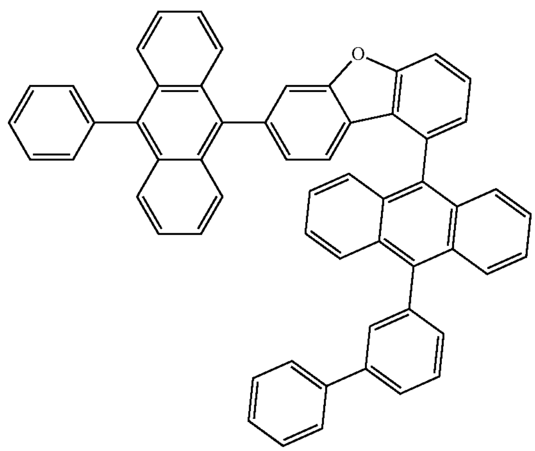

-continued
511
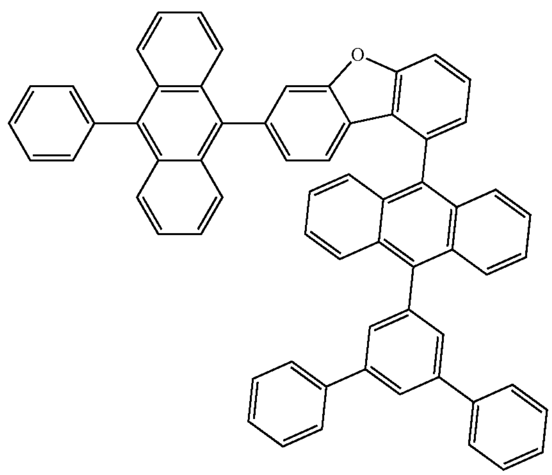
512
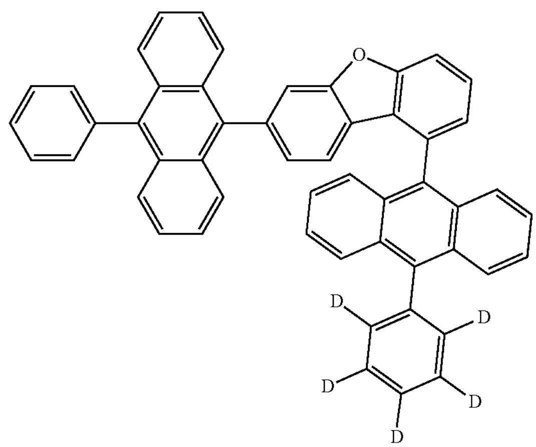
513
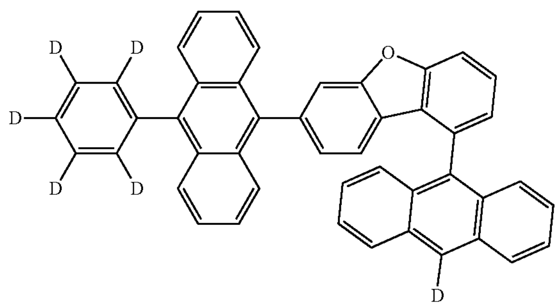
514
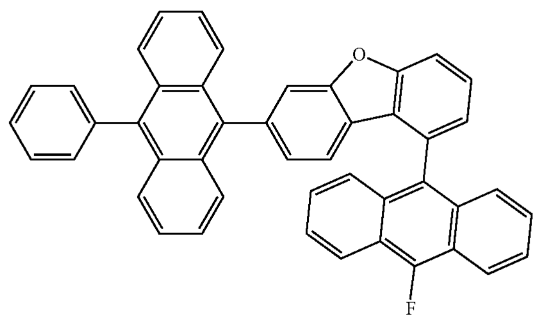
515
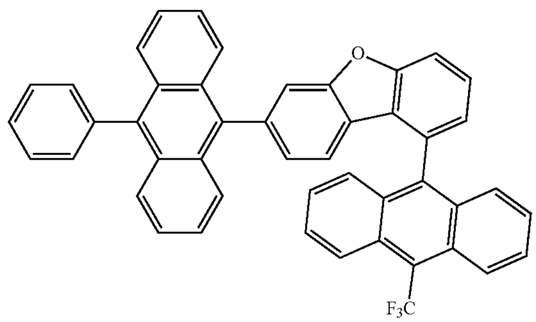
516
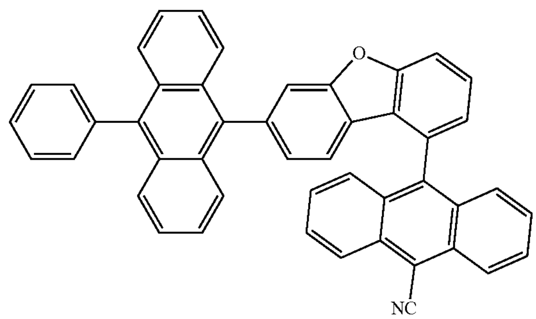
517
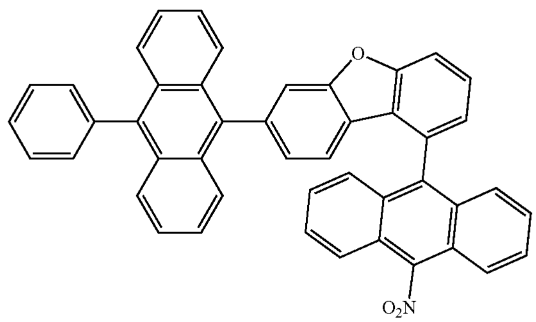
518
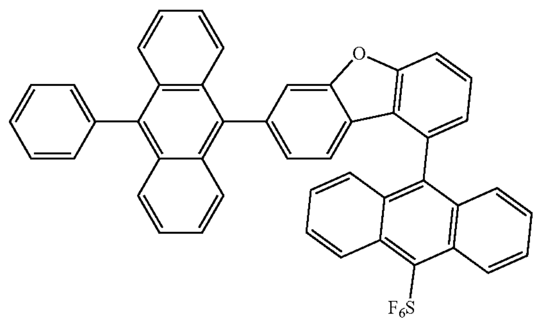

-continued
519
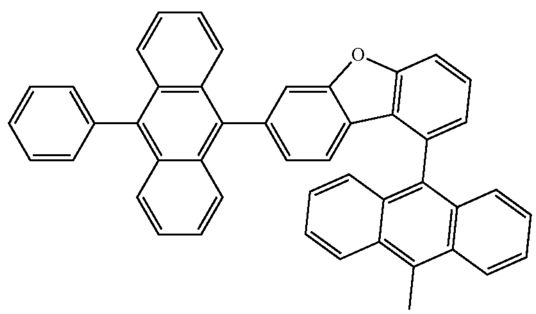
520
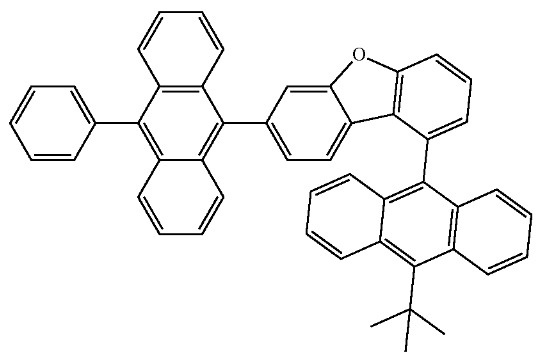
521
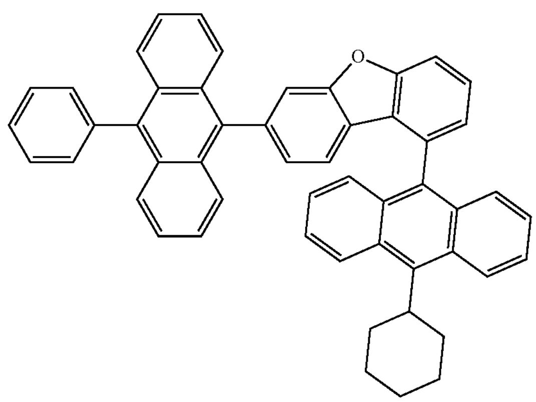
522
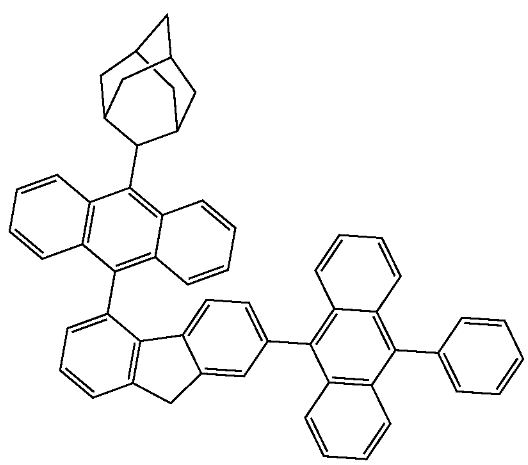
523
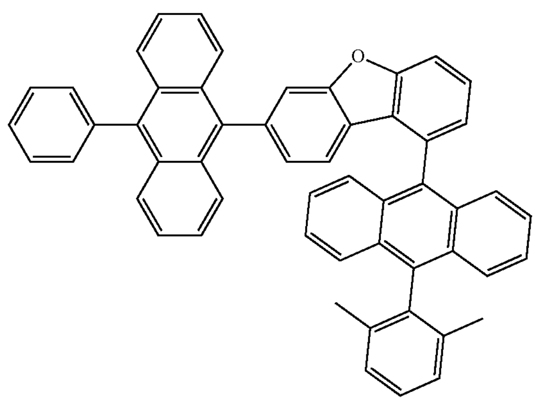
524
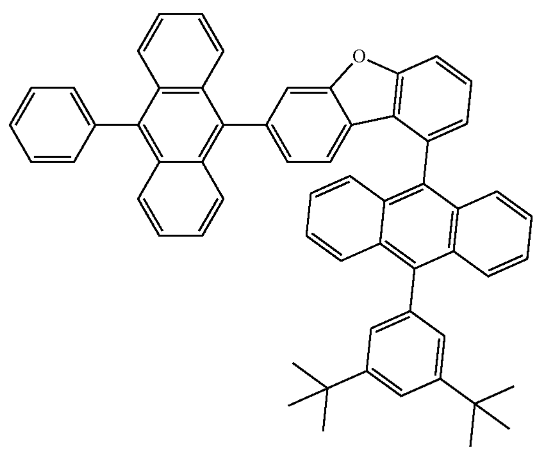

-continued
525
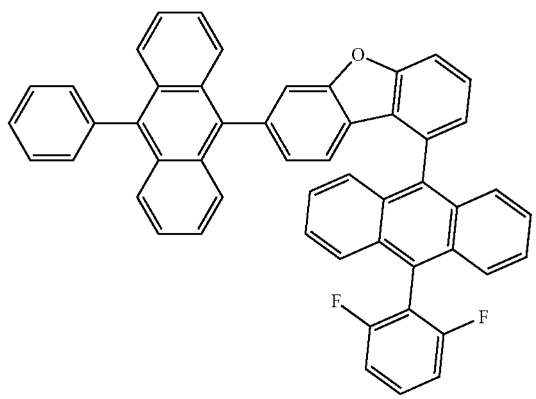
526
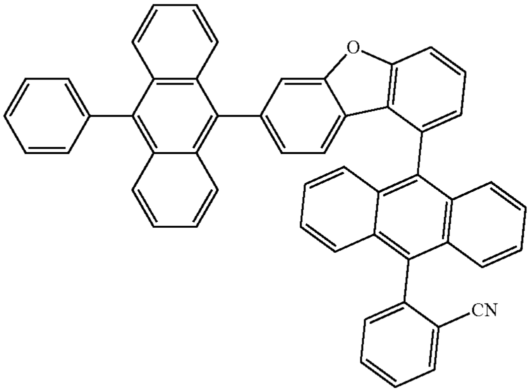
527
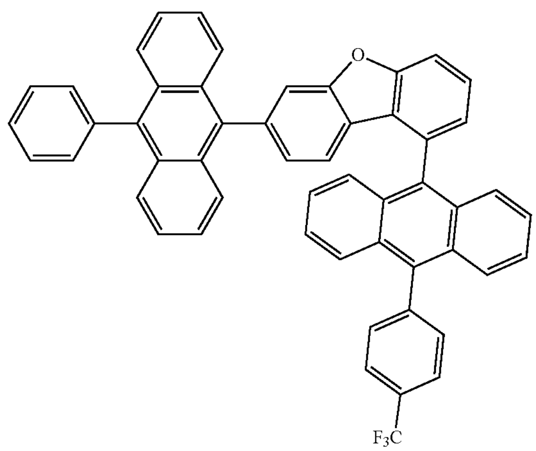
528
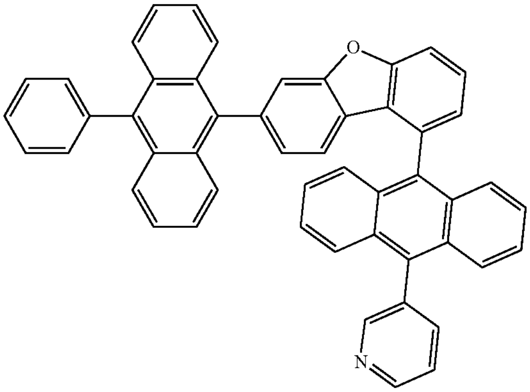
529
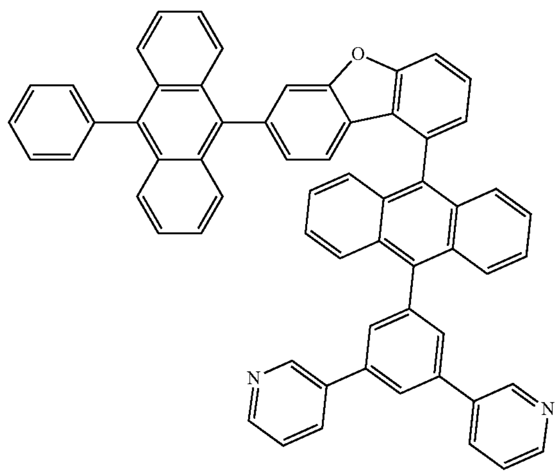
530
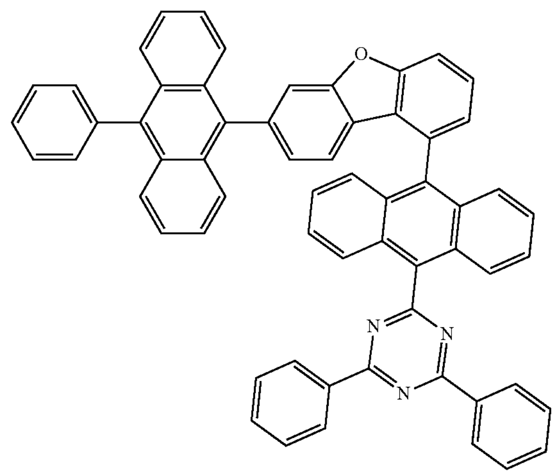

-continued
531
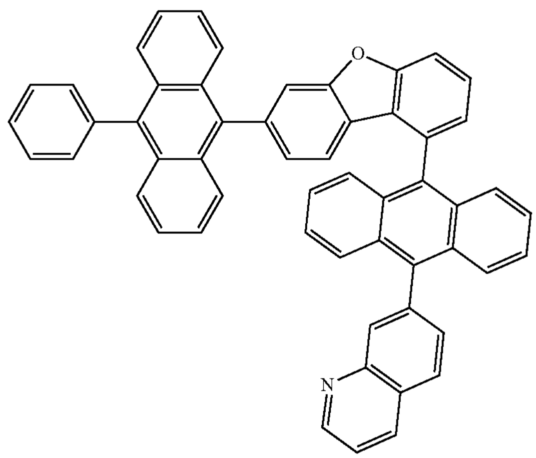
532
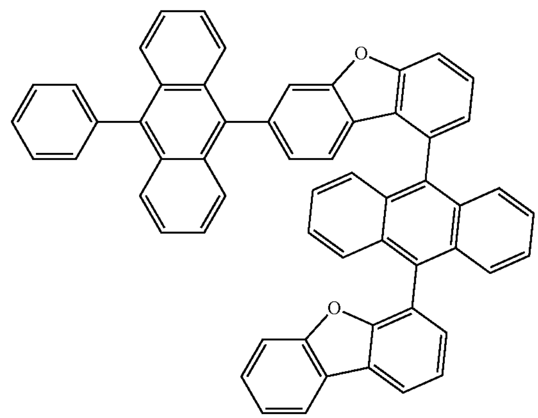
533
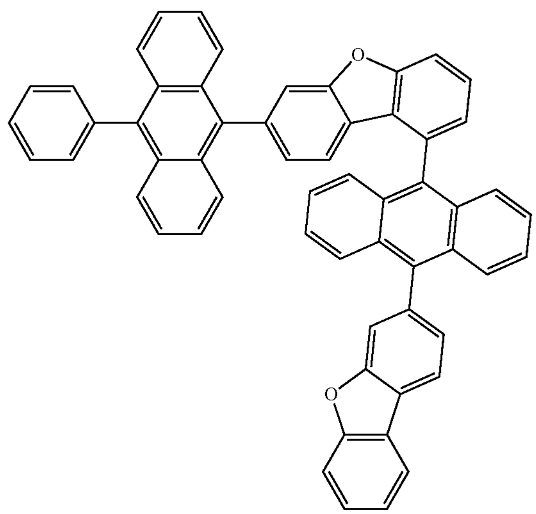
534
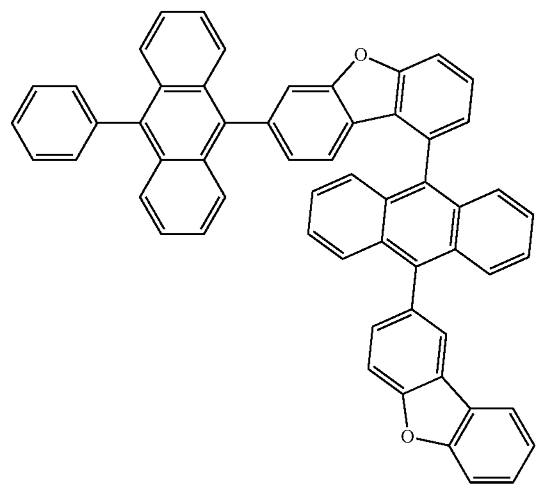
535
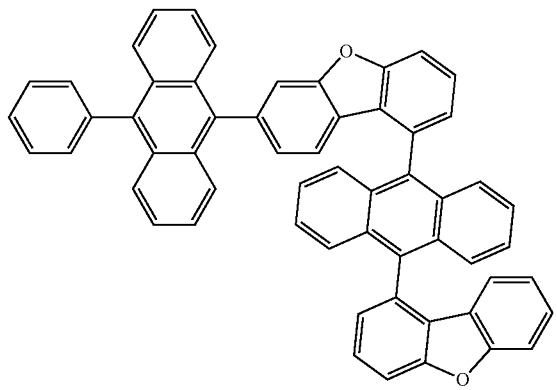
536
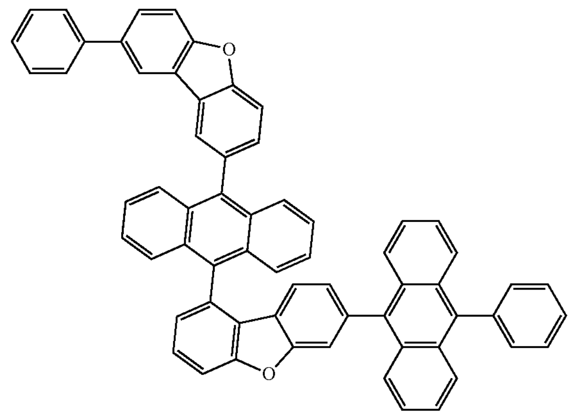

-continued
537
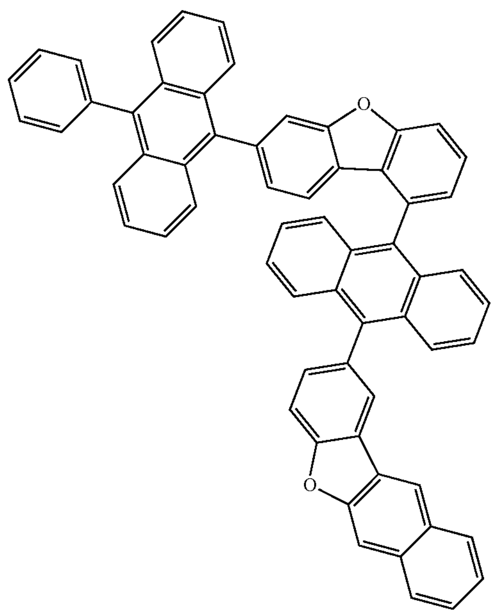
538
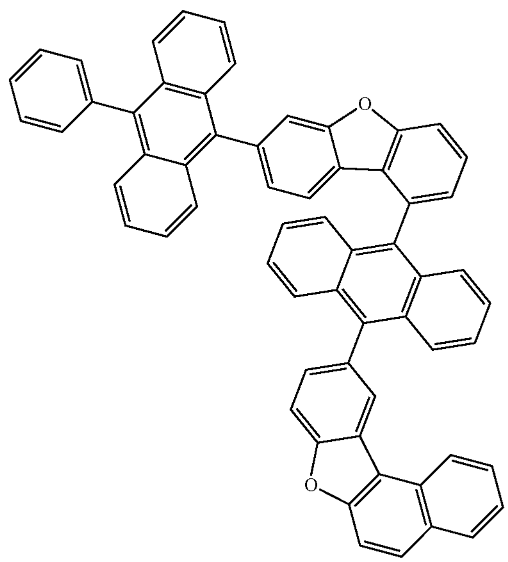
539
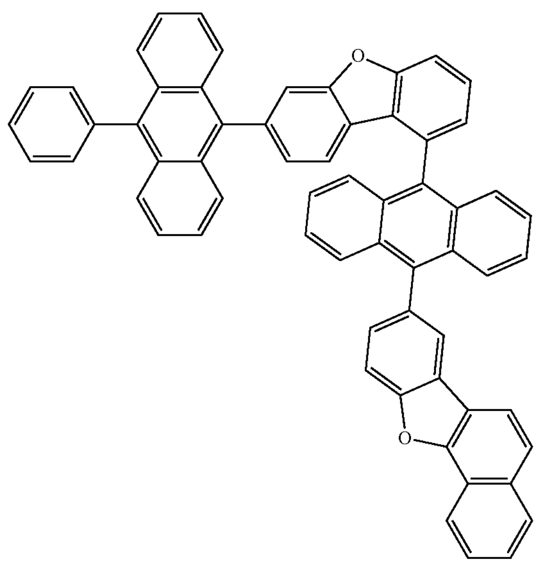
540
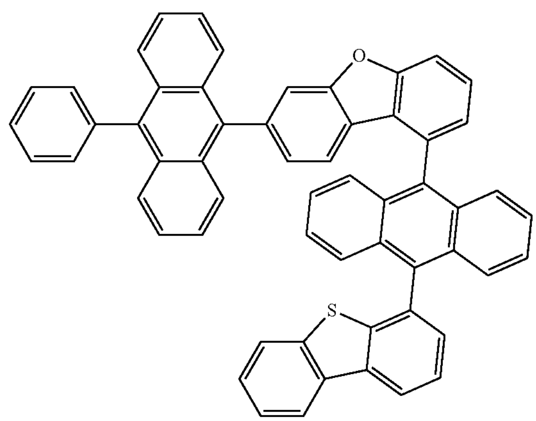

-continued
541
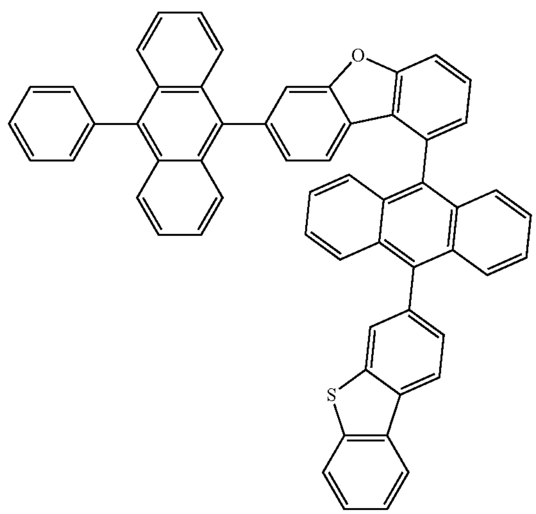
542
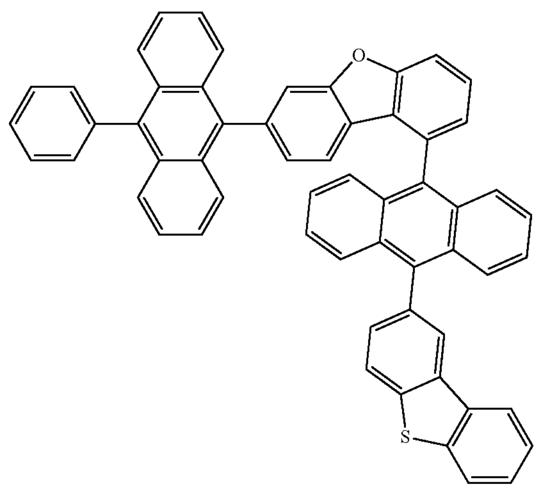
543
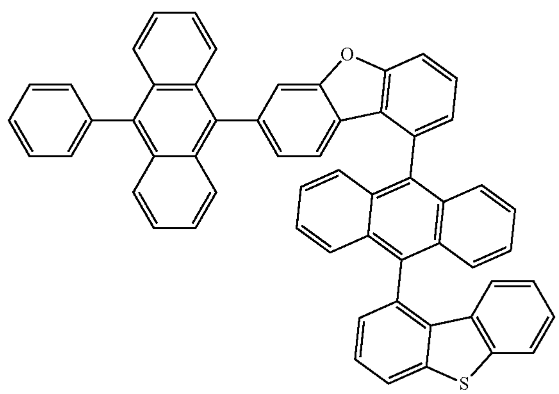
544
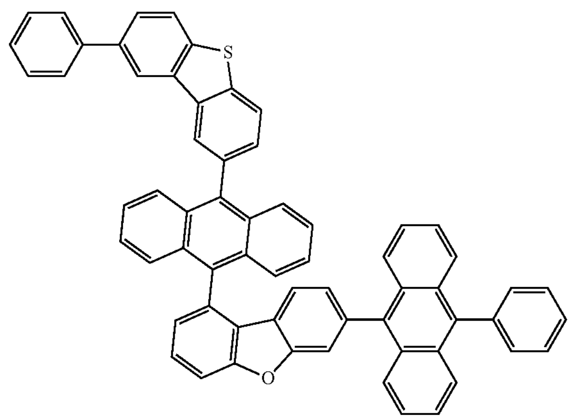
545
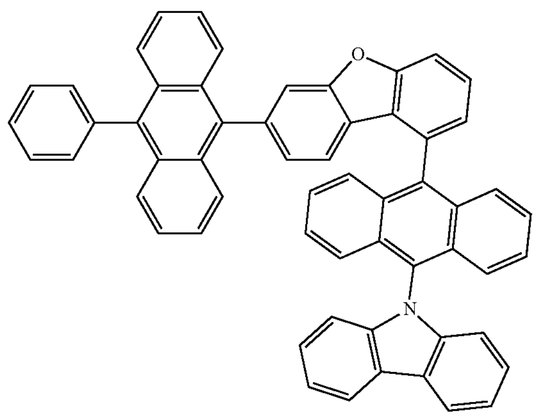
546
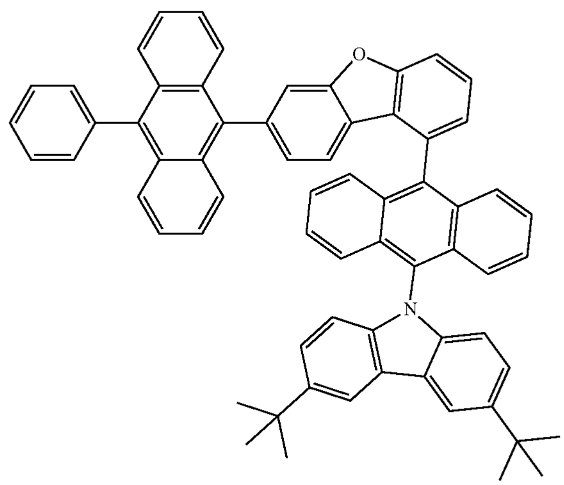

-continued
547
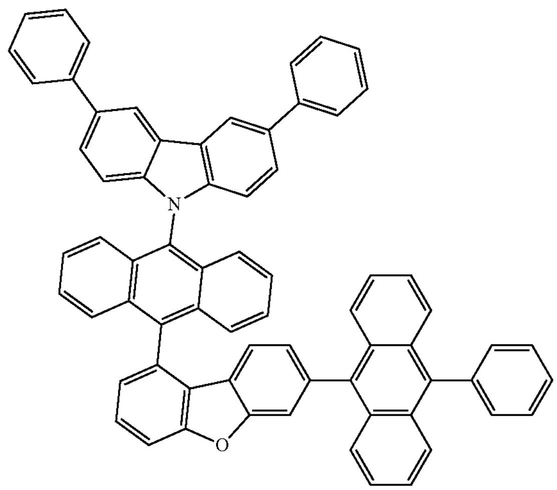
548
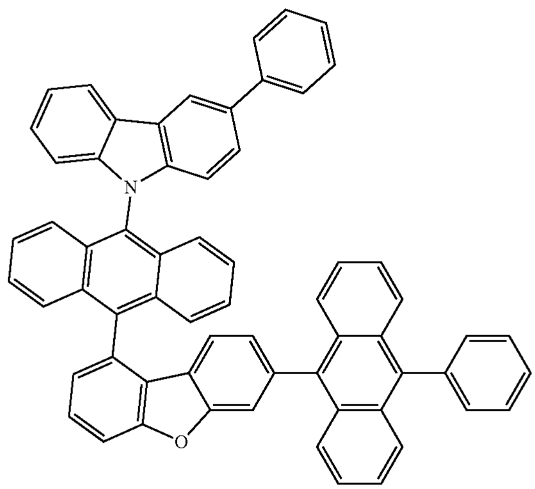
549
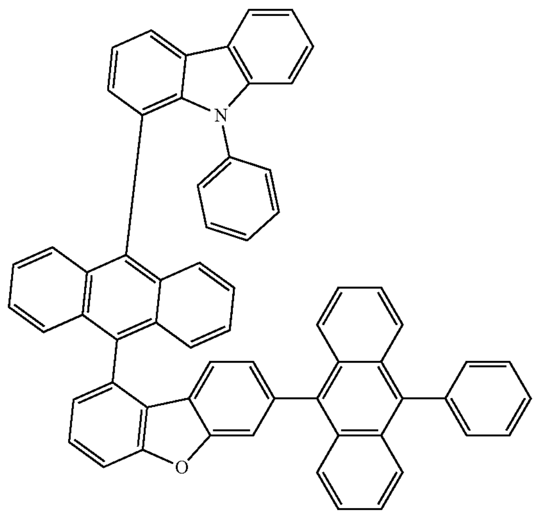
550
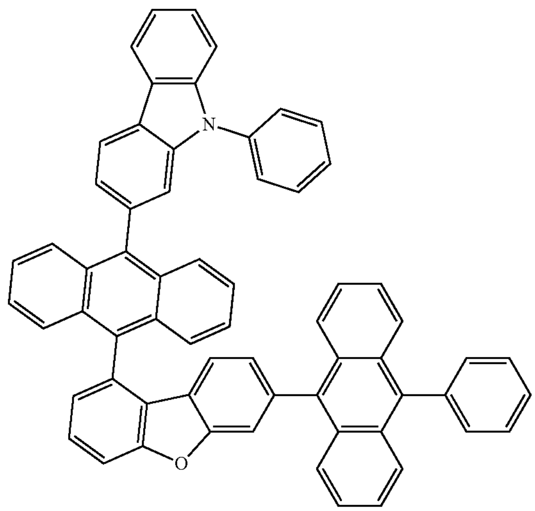
551
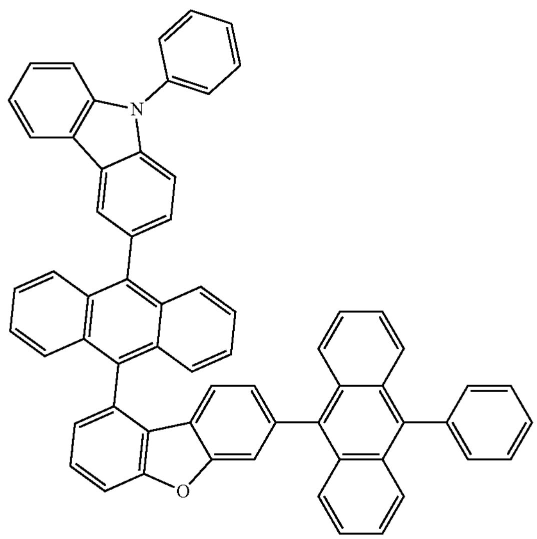
552
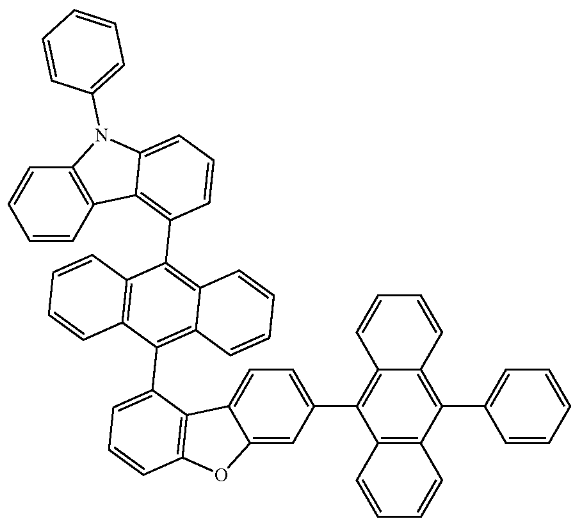

-continued
553
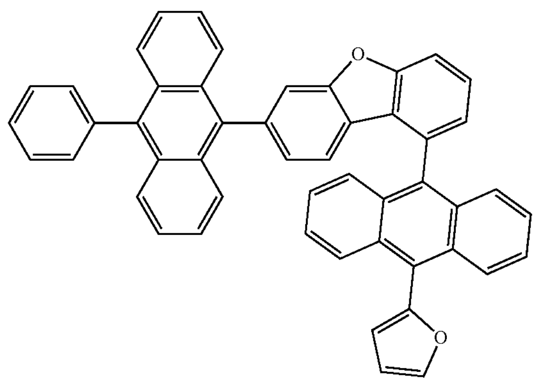
554
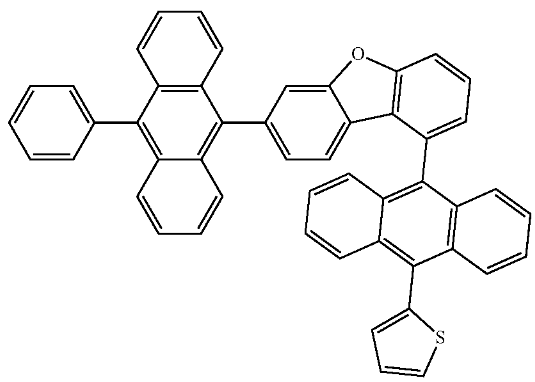
555
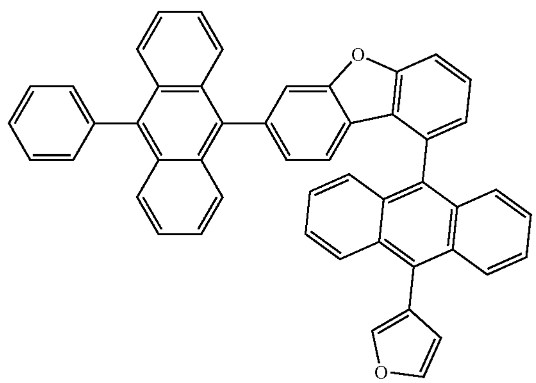
556
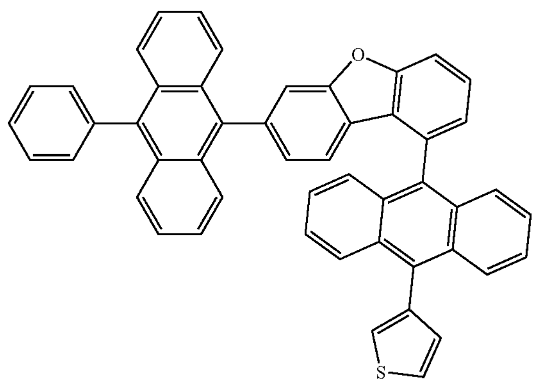
557
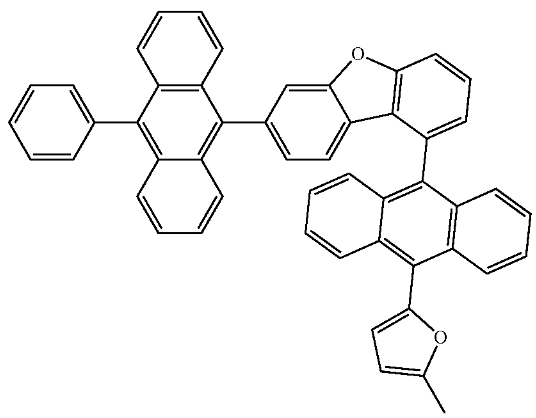
558
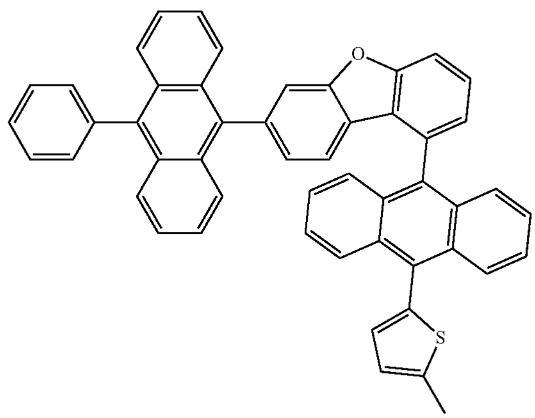
559
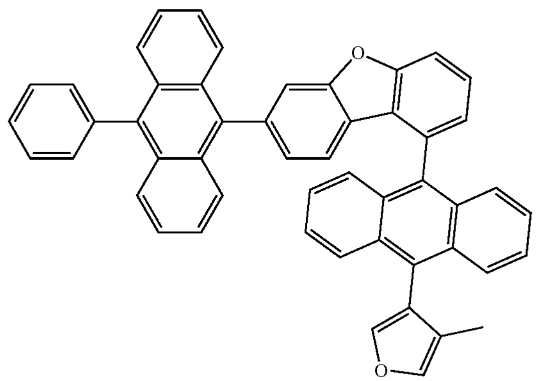
560
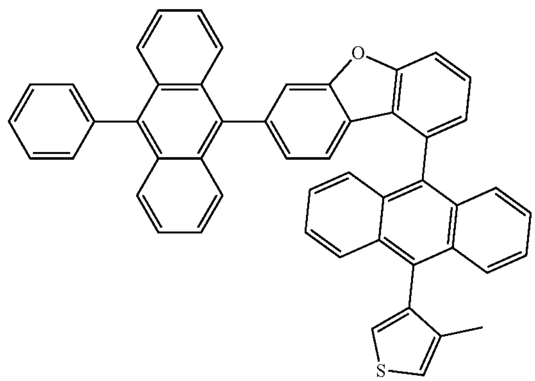

-continued
561
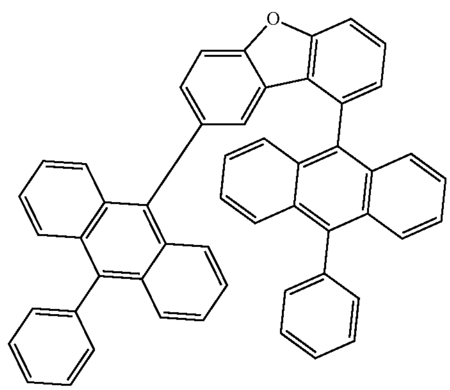
562
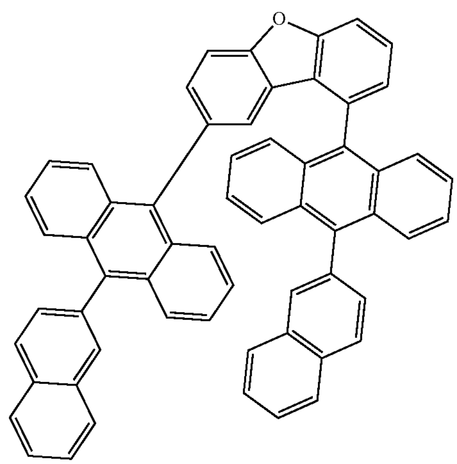
563
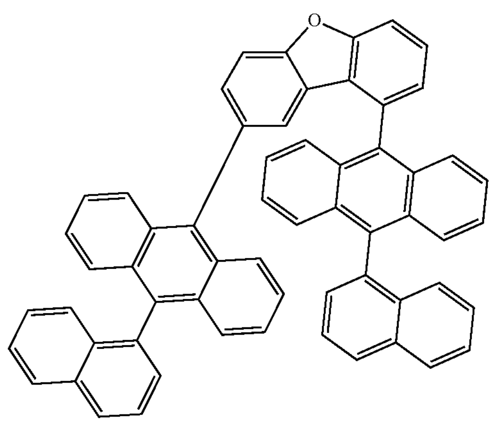
564
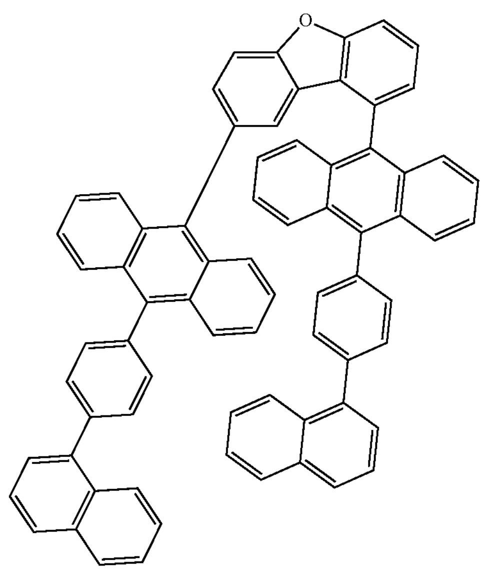
565
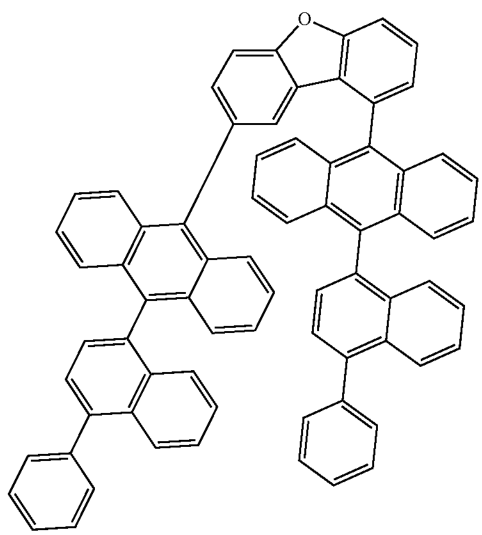
566
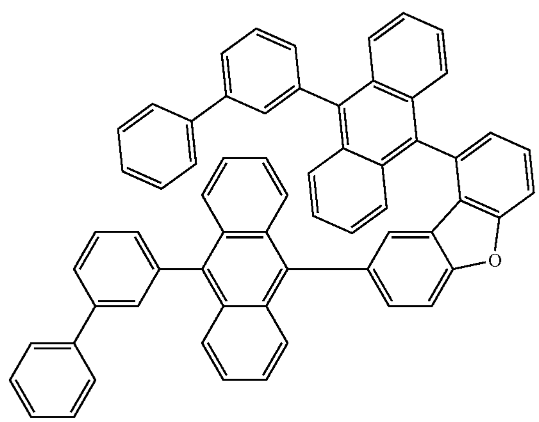

-continued
567
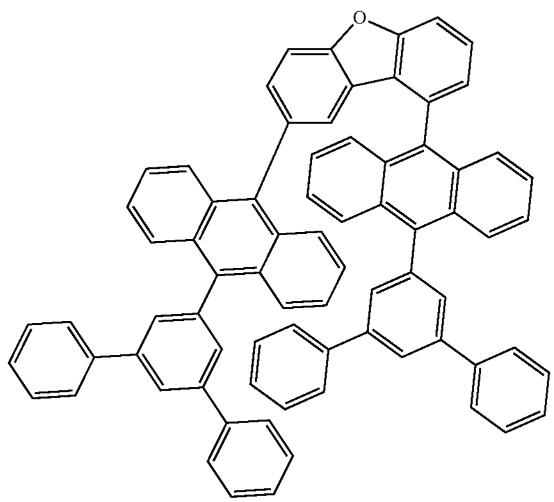
568
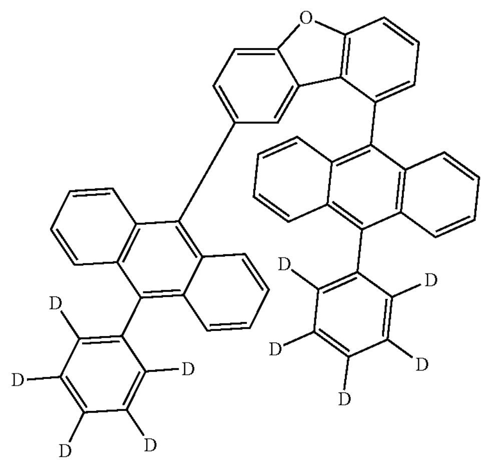
569
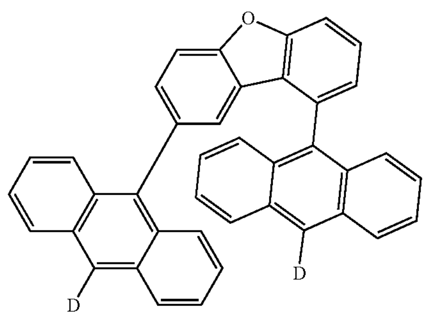
570
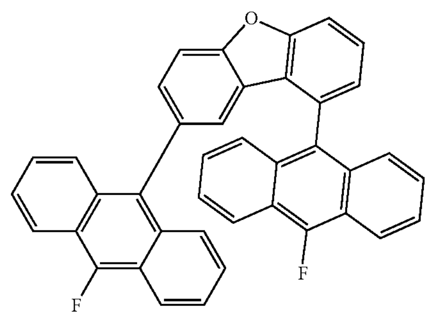
571
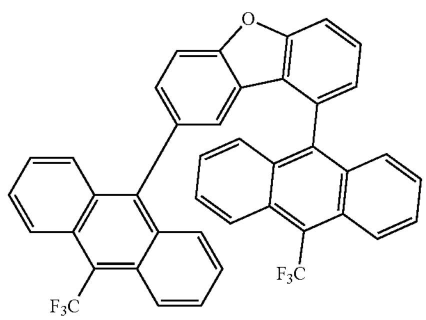
572
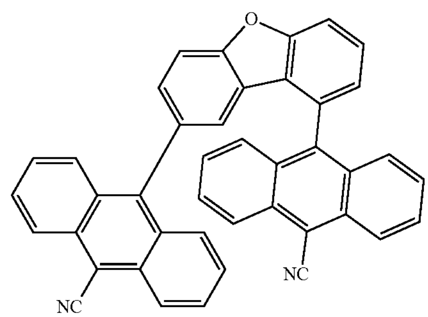
573
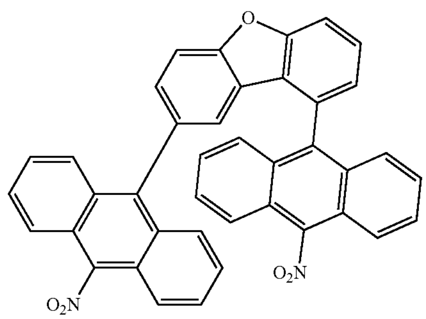
574
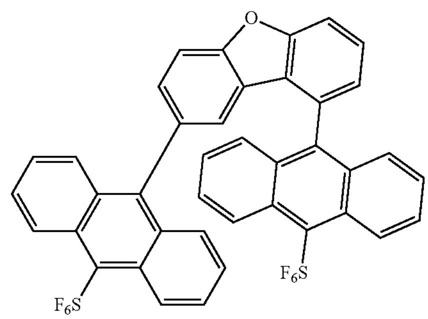

-continued
575
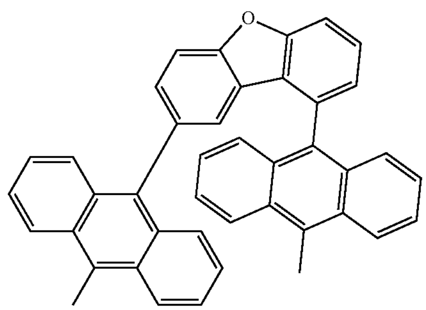
576
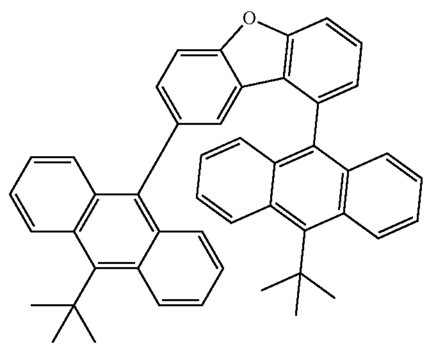
577
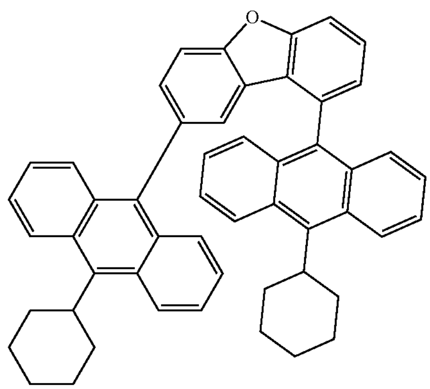
578
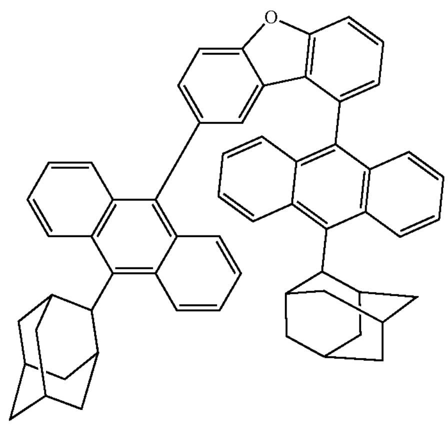
579
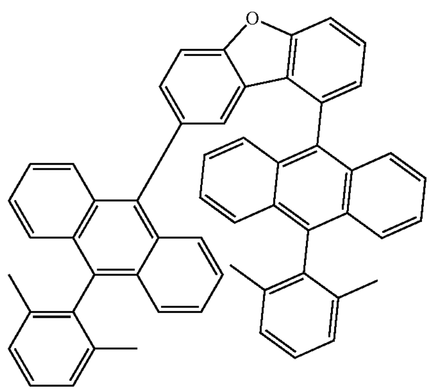
580
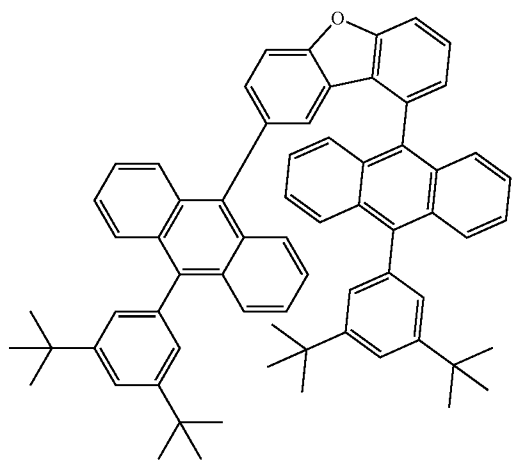
581
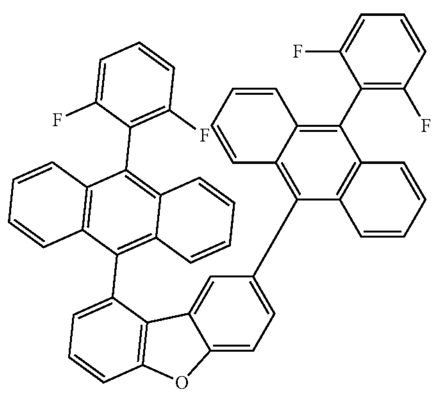
582
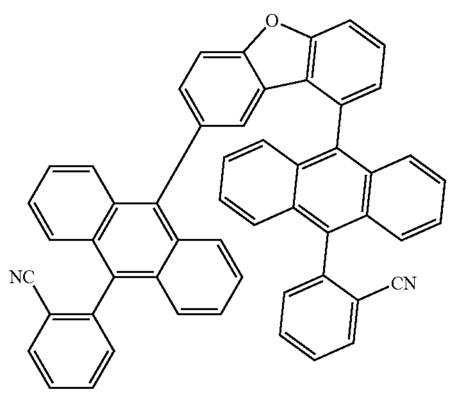

-continued
583
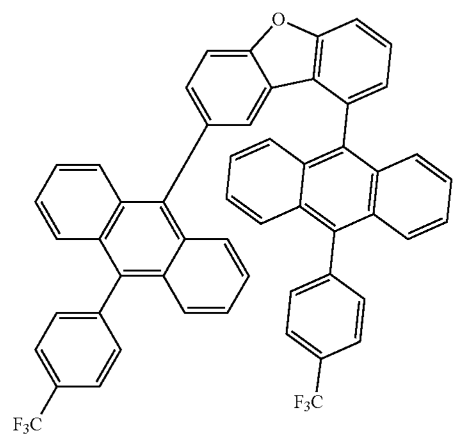
584
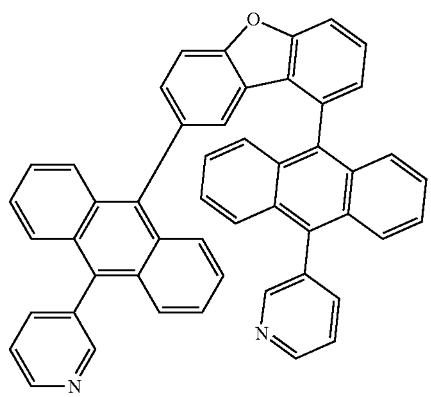
585
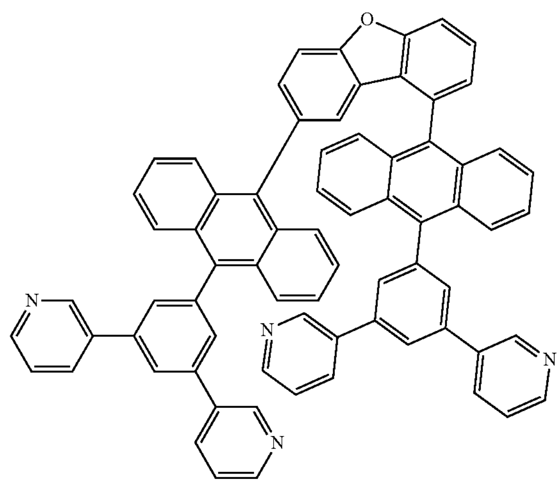
586
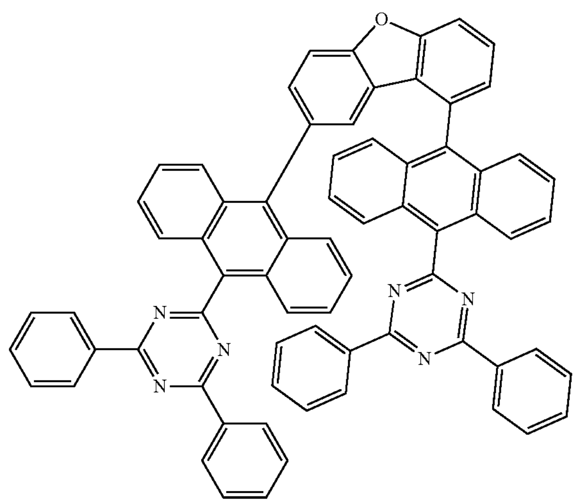
587
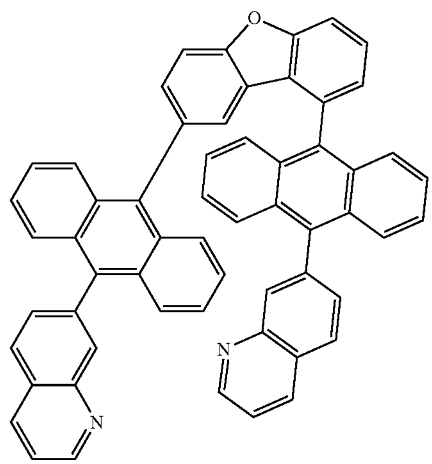
588
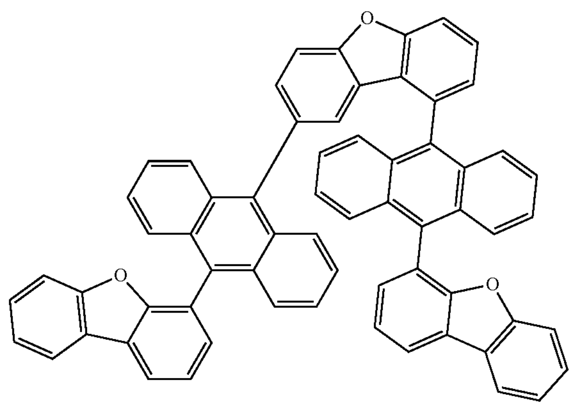

-continued
589
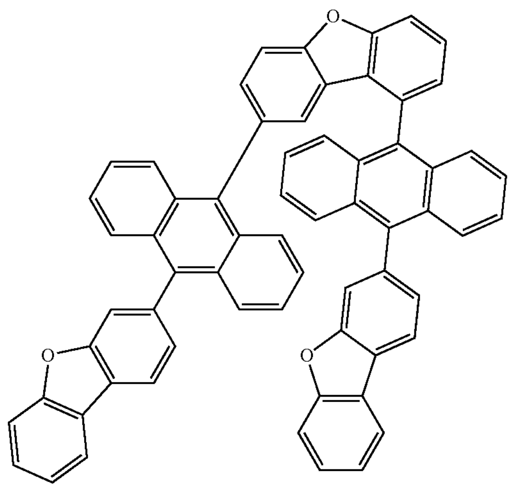
590
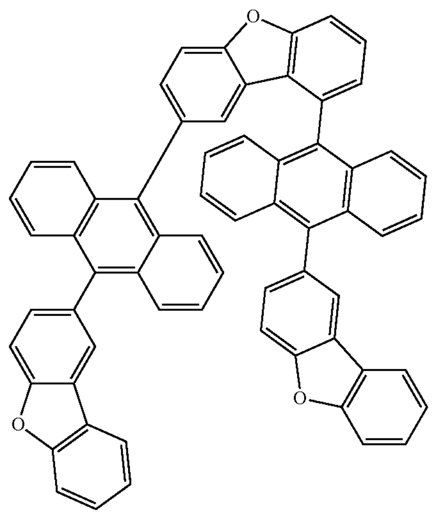
591
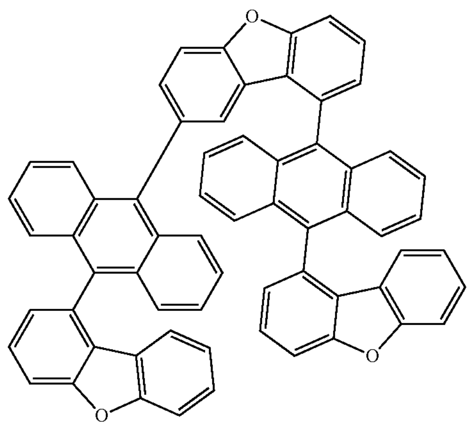
592
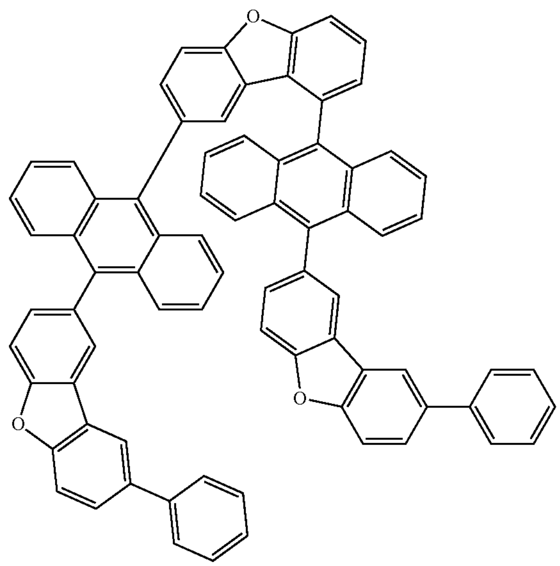
593
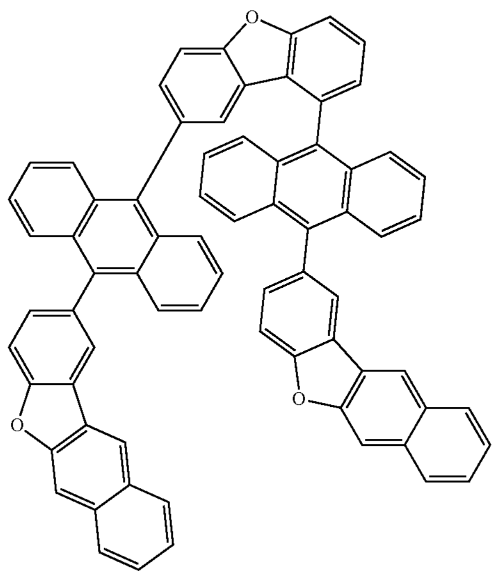
594
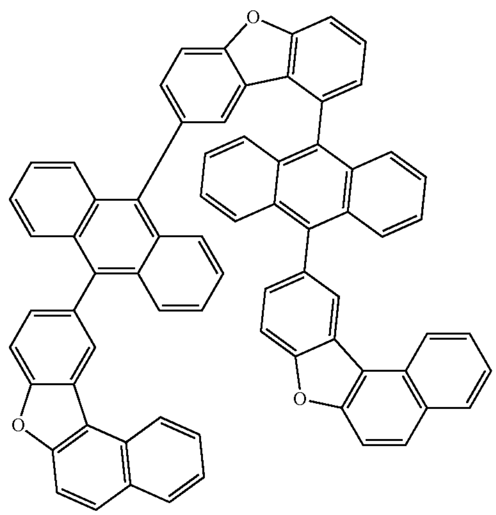

-continued
595
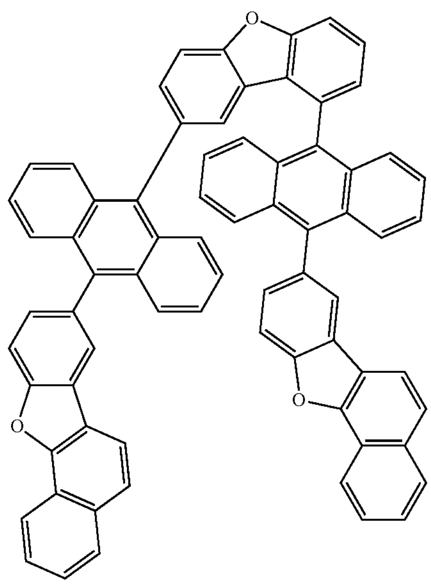
596
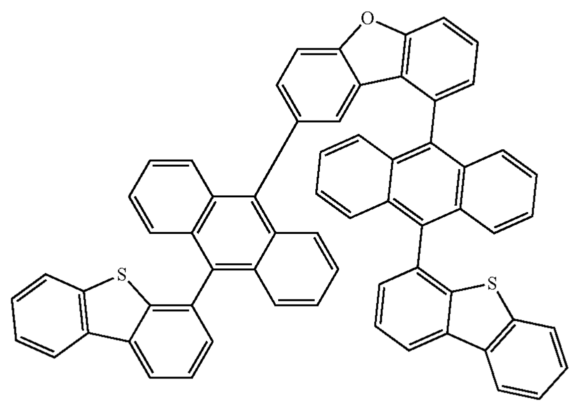
597
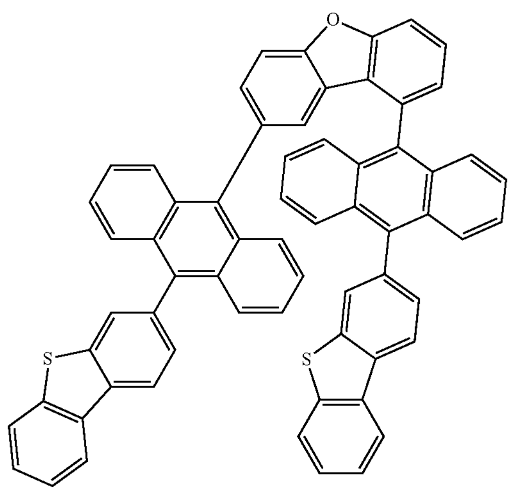
598
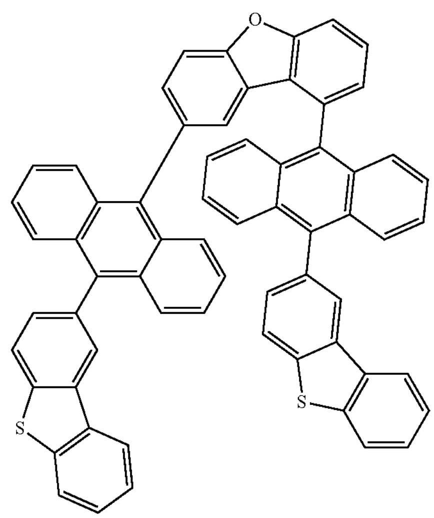

-continued
599
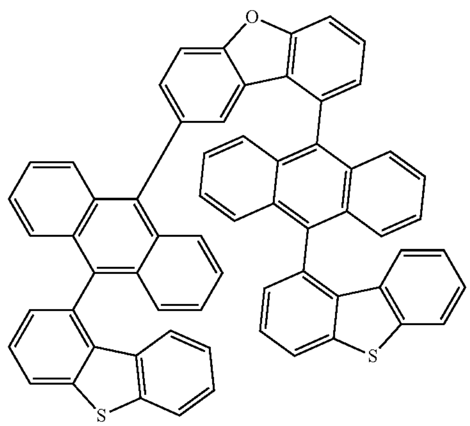
600
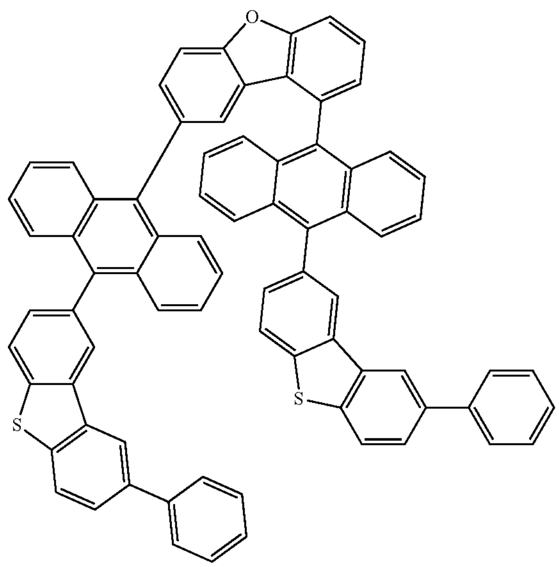
601
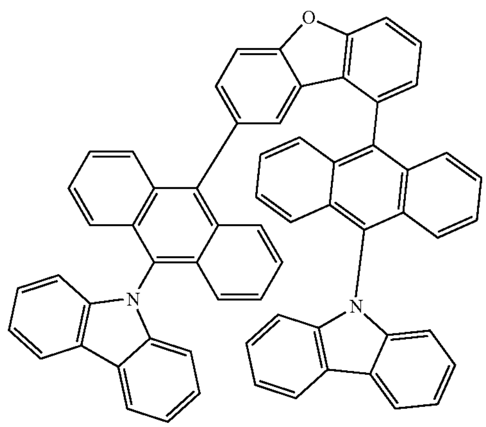
602
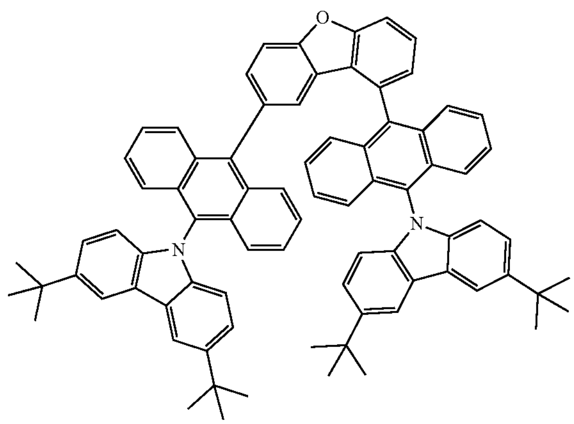

-continued
603
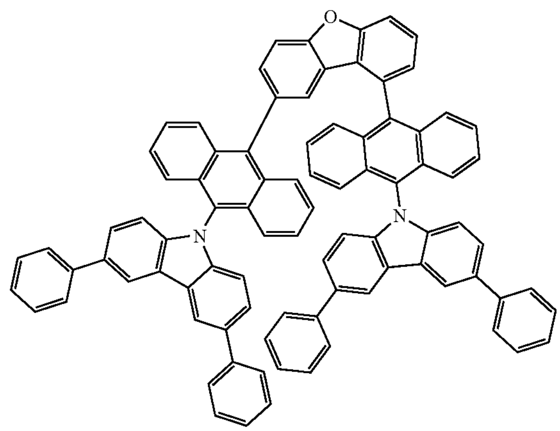
604
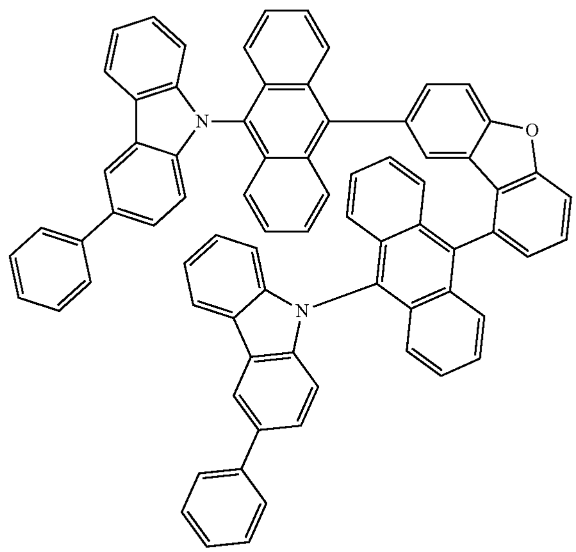
605
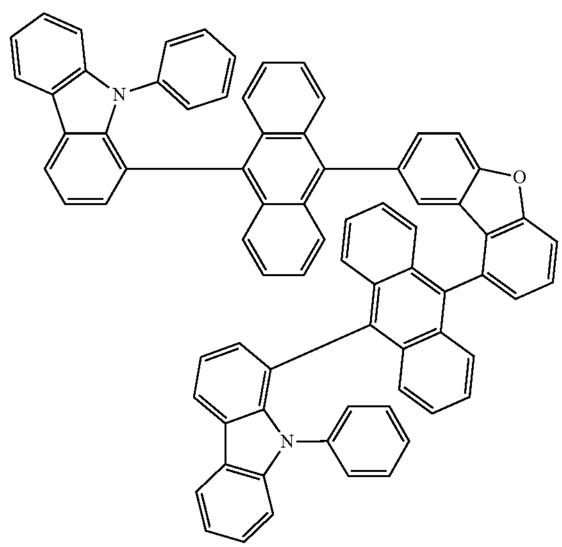
606
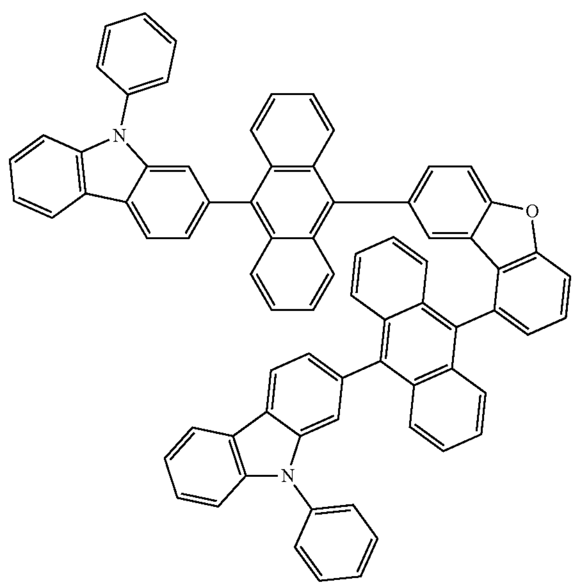

-continued
607
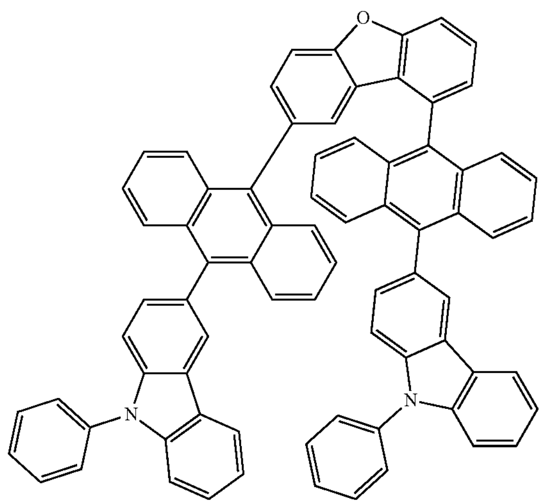
608
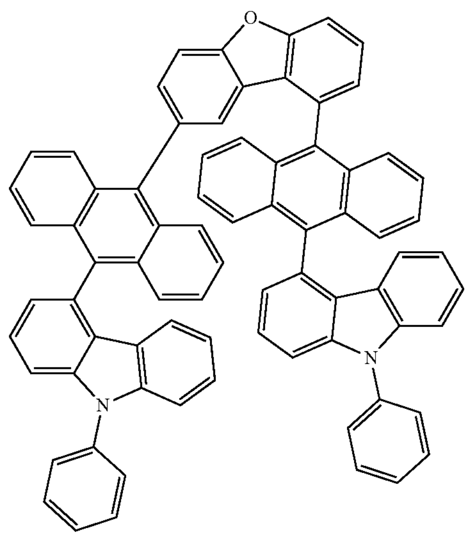
609
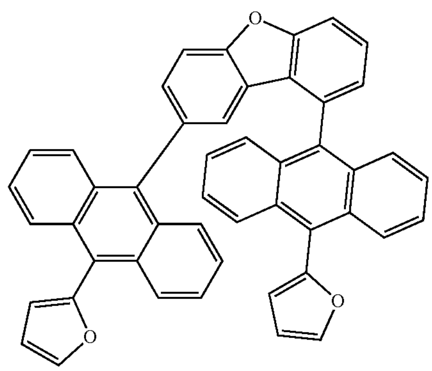
610
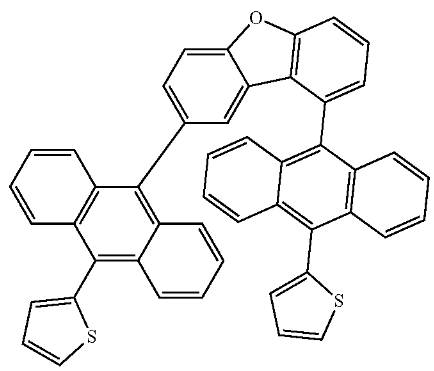
611
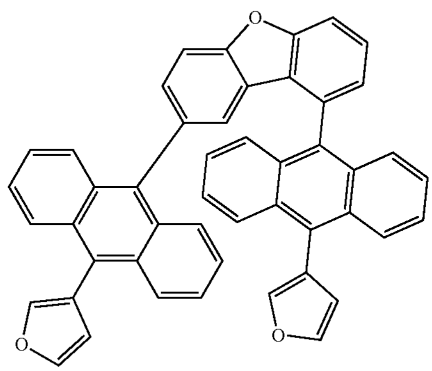
612
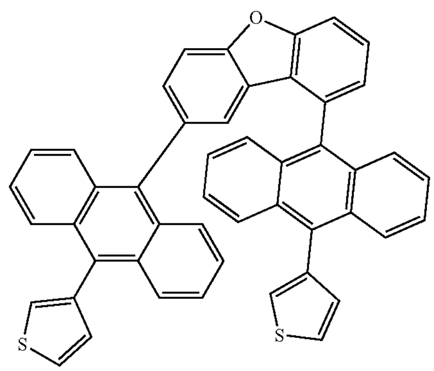

-continued
613
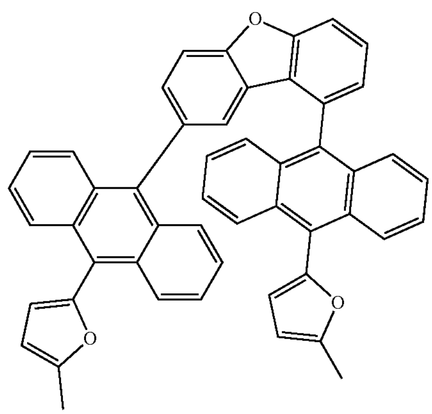
614
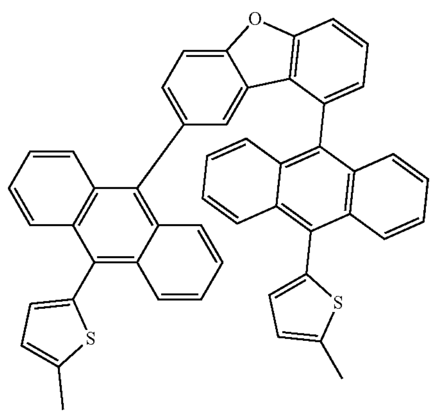
615
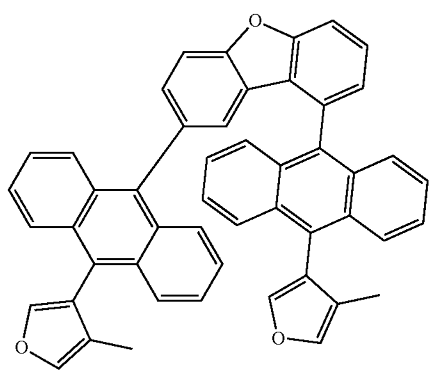
616
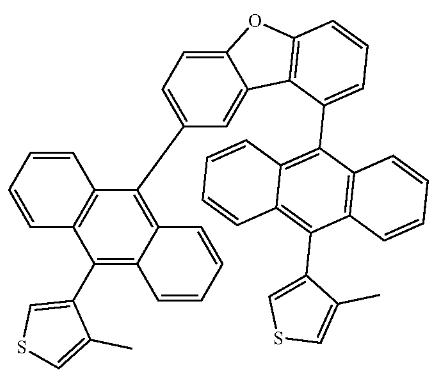
617
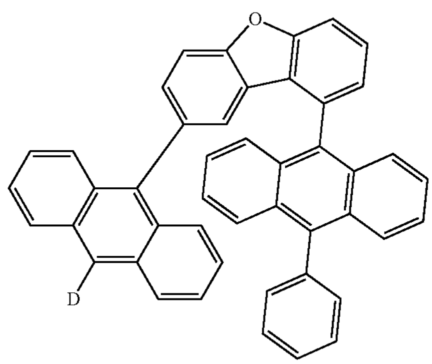
618
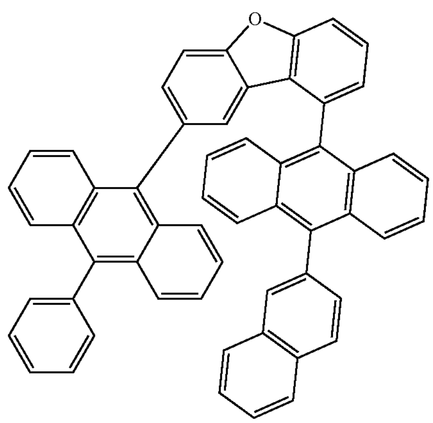

-continued
619
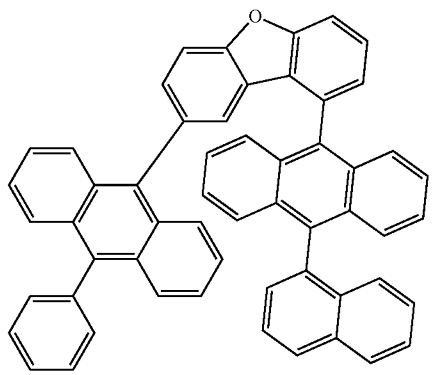
620
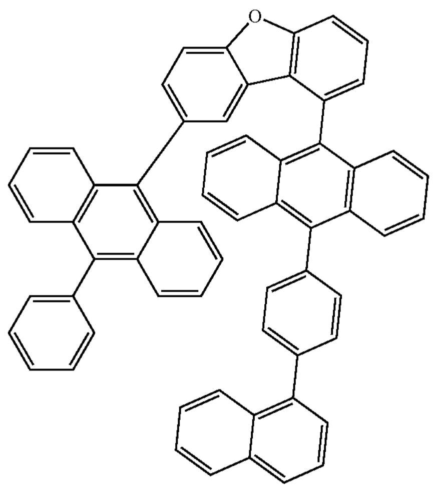
621
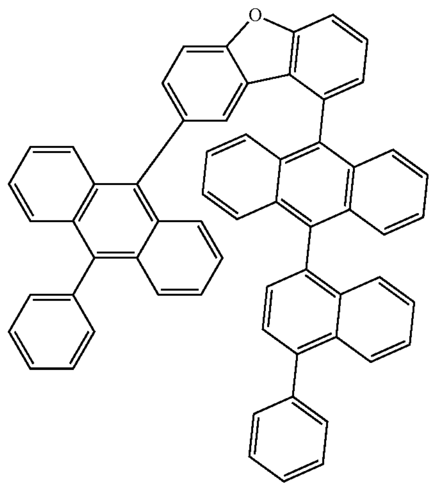
622
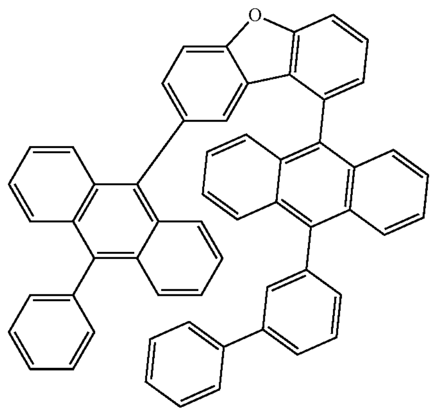
623
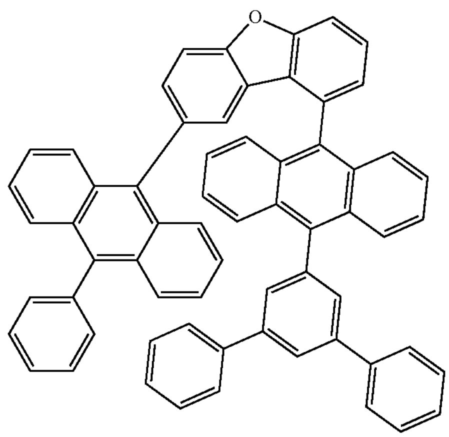
624
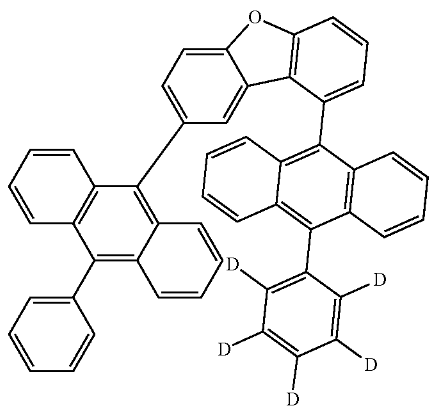

-continued
625
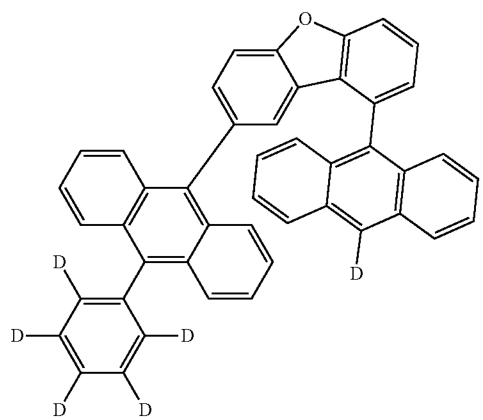
626
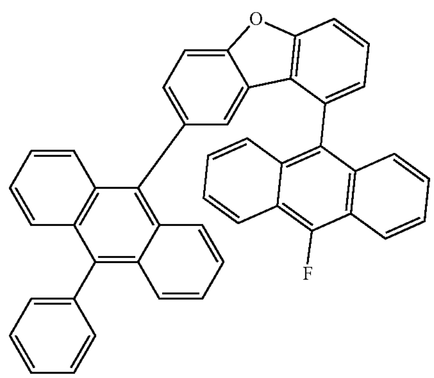
627
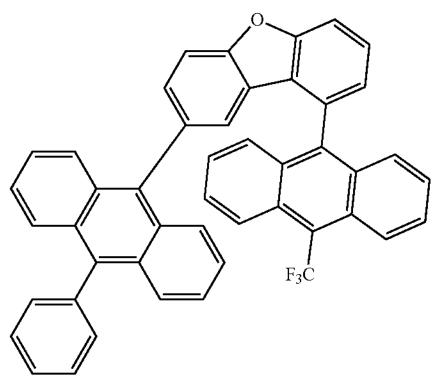
628
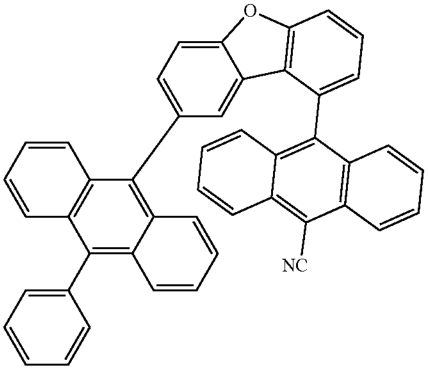
629
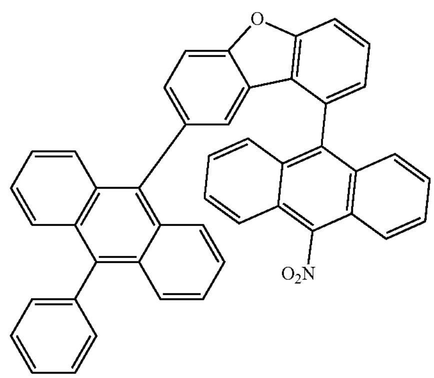
630
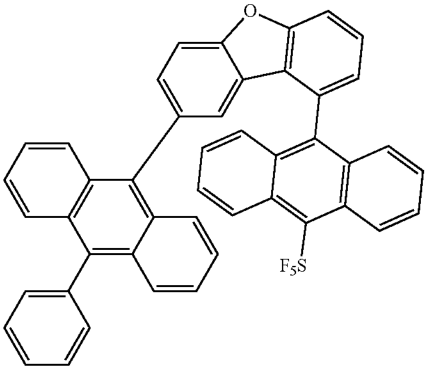
631
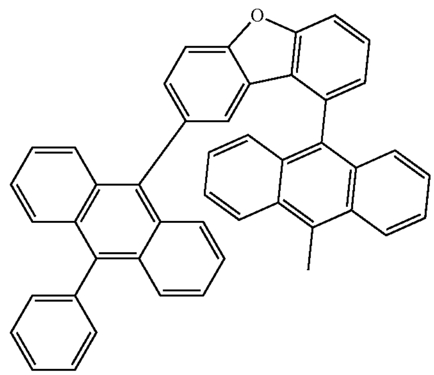
632
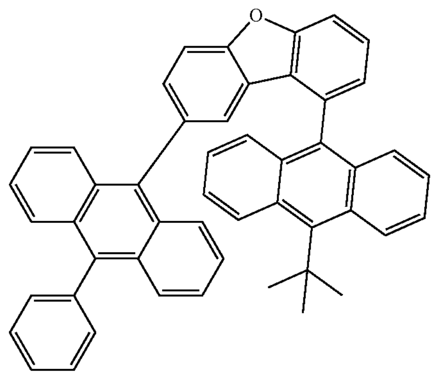

-continued
633
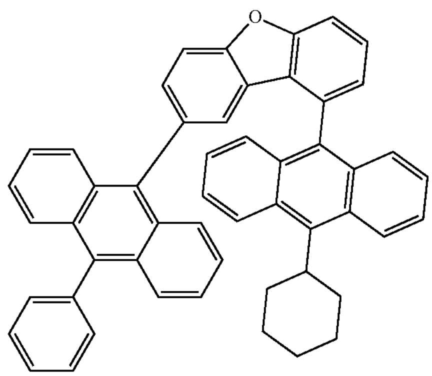
634
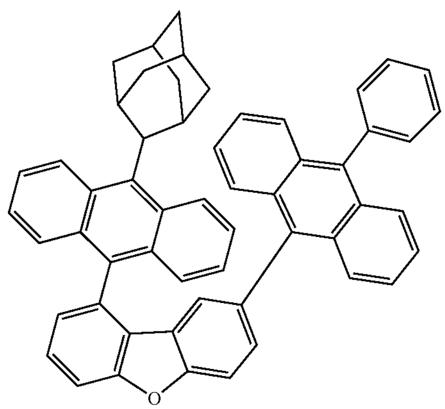
635
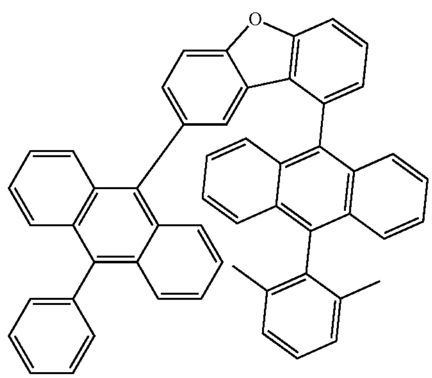
636
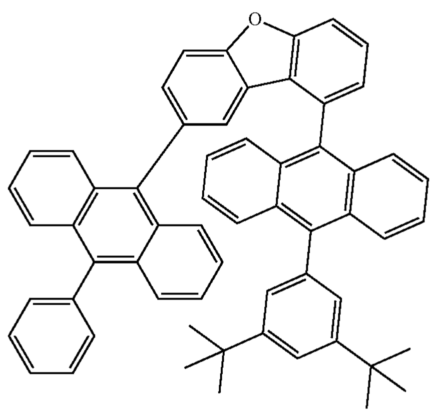
637
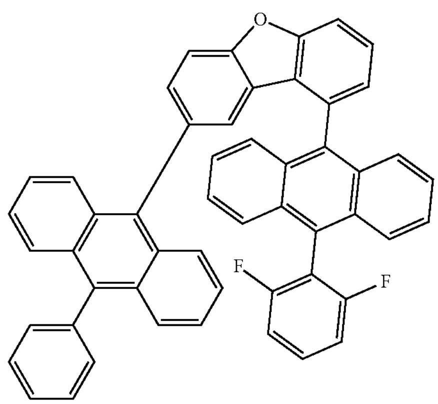
638
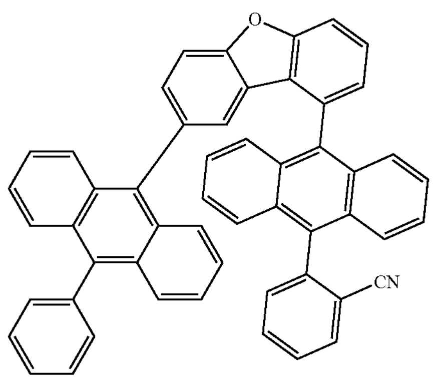
639
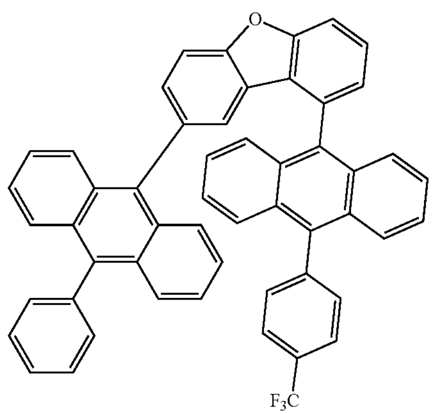
640
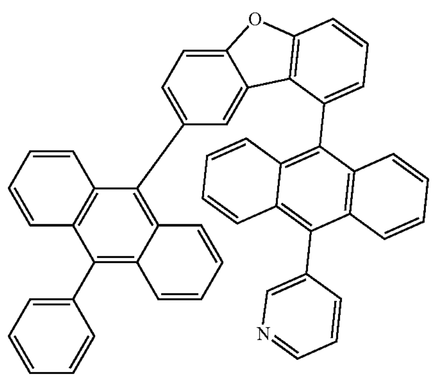

-continued
641
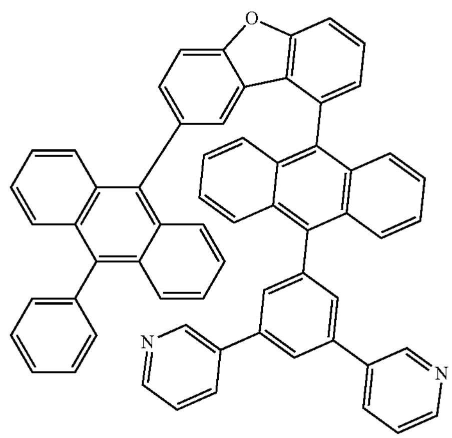
642
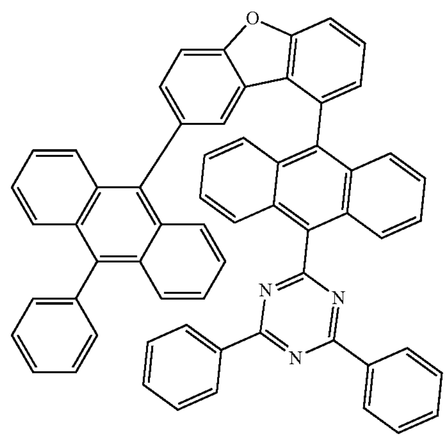
643
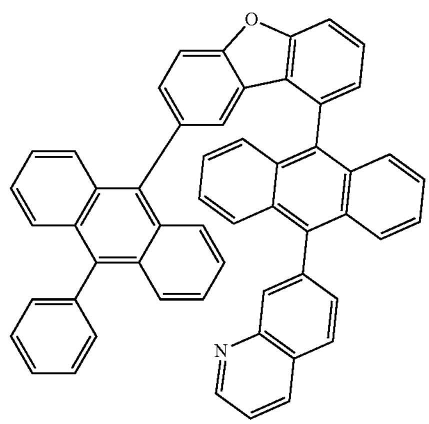
644
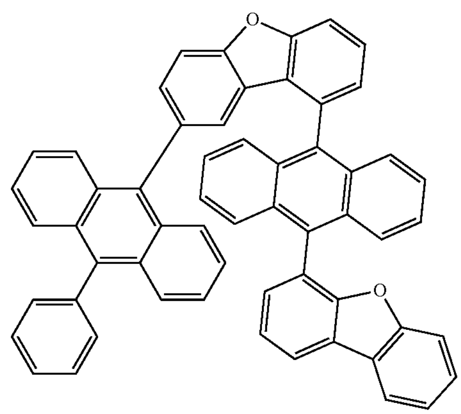
645
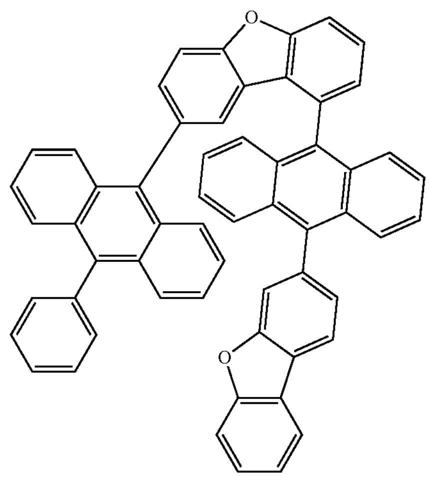
646
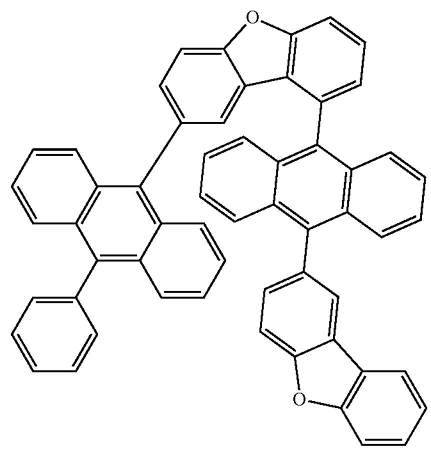

-continued
647
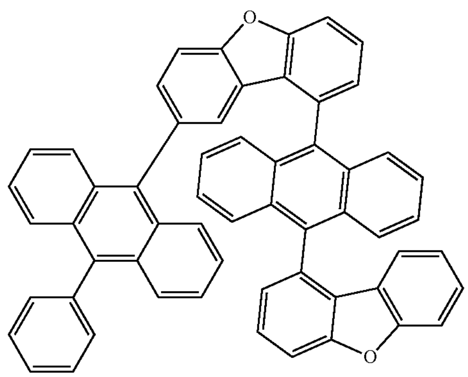
648
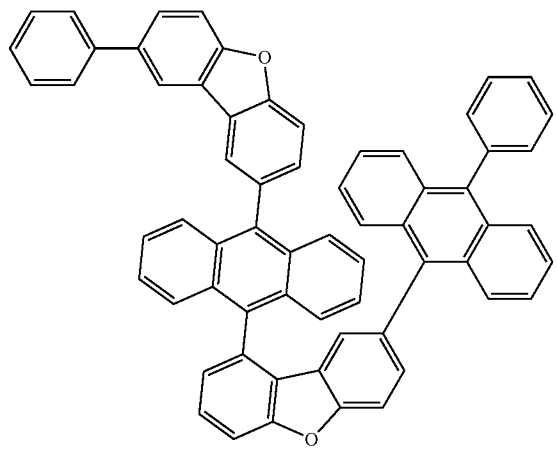
649
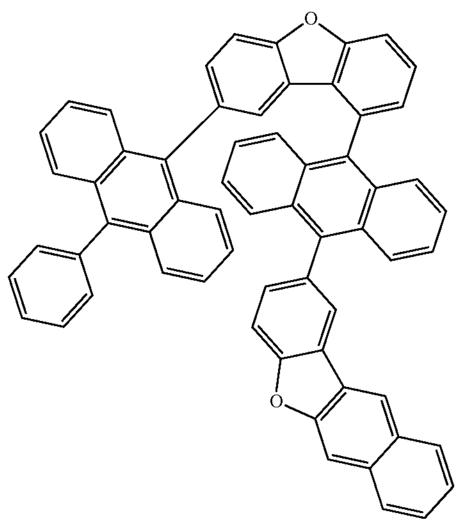
650
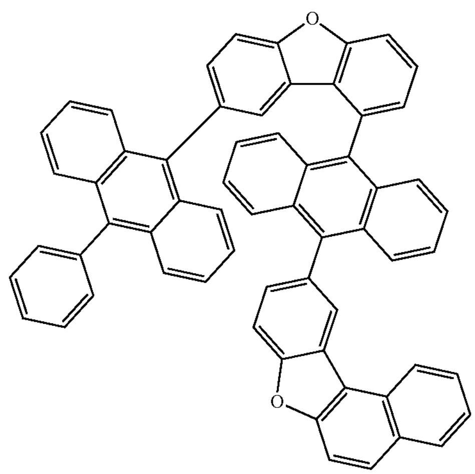
651
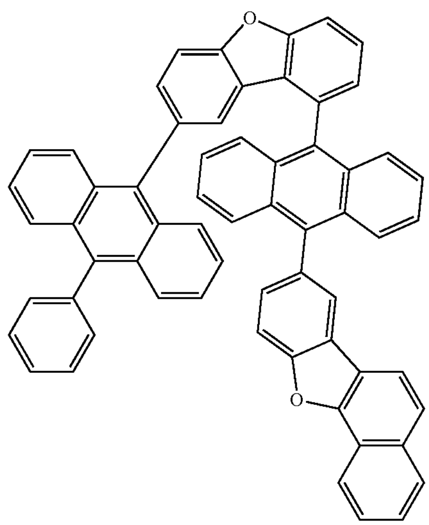
652
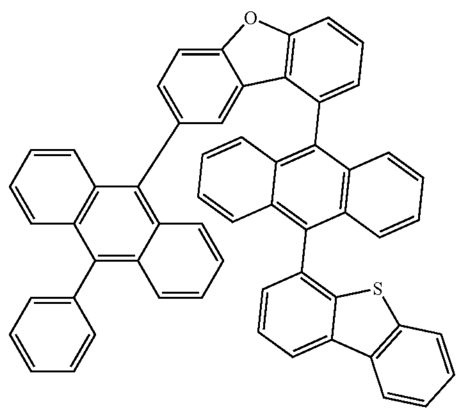

-continued
653
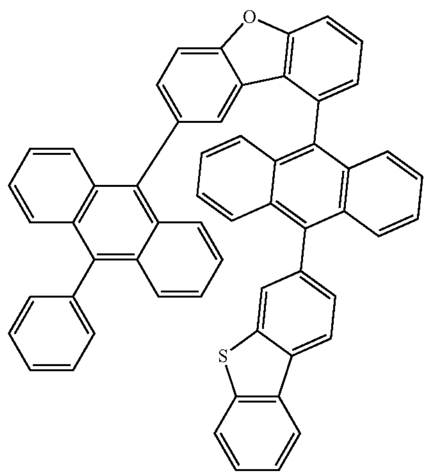
654
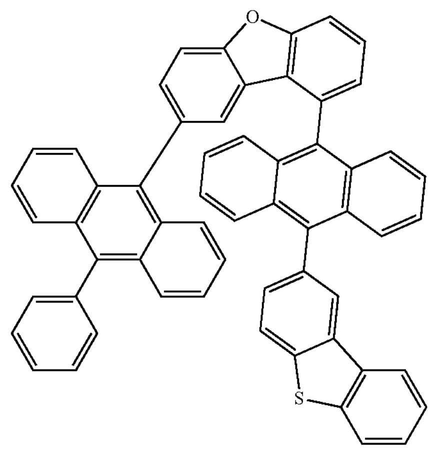
655
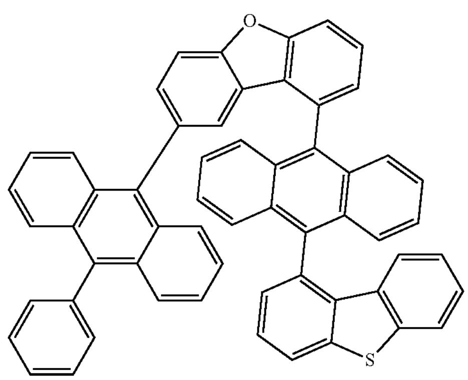
656
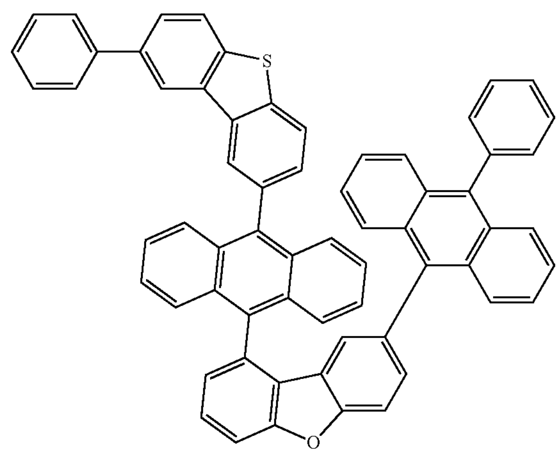
657
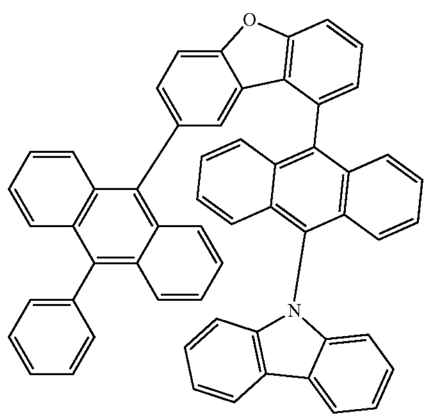
658
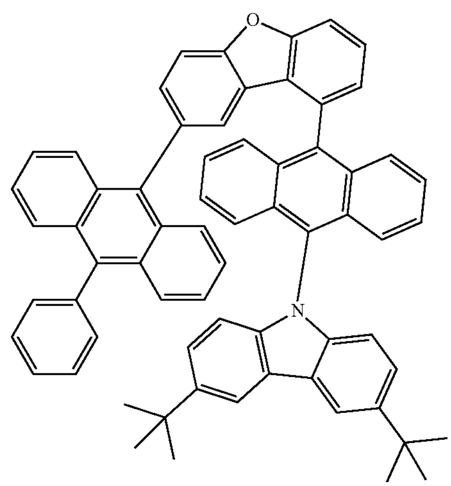

-continued
659
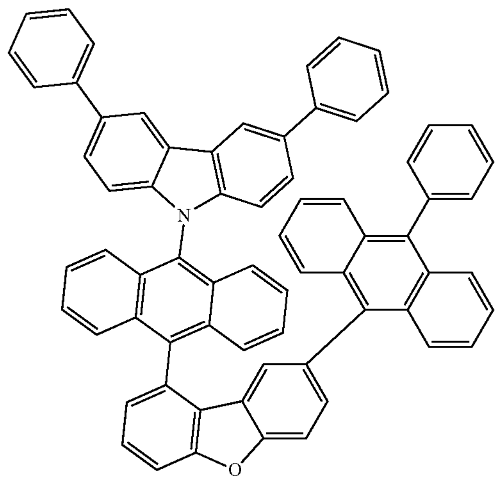
660
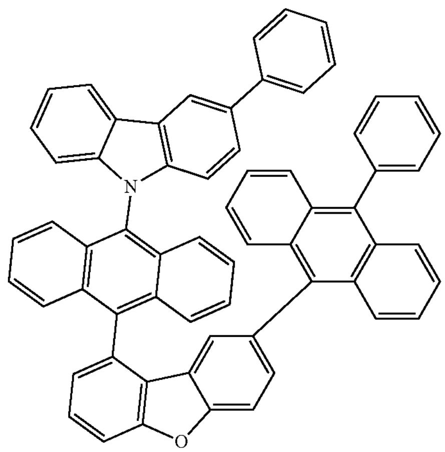
661
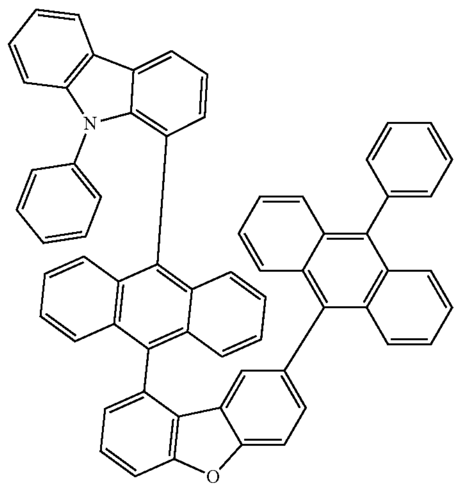
662
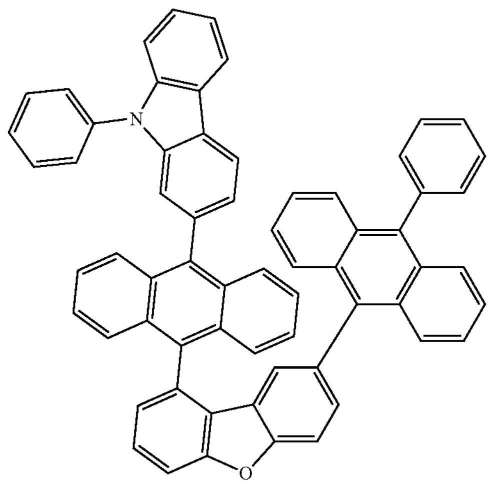
663
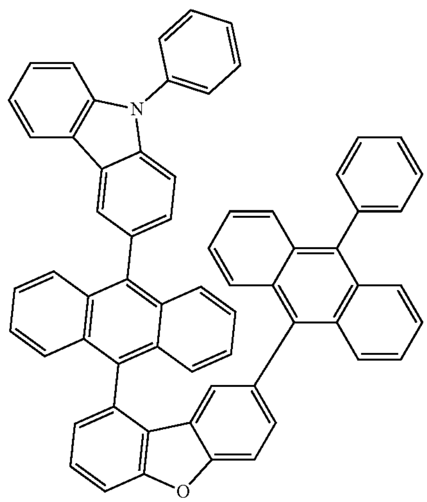
664
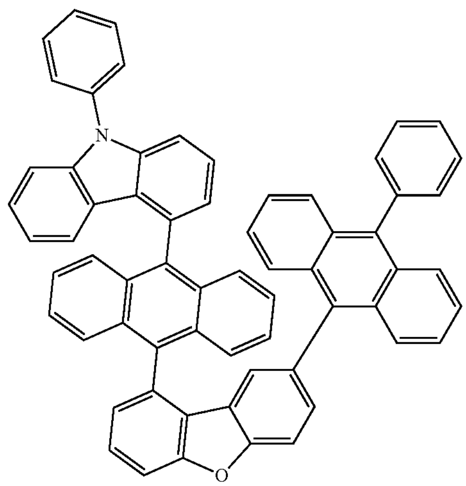

-continued
665
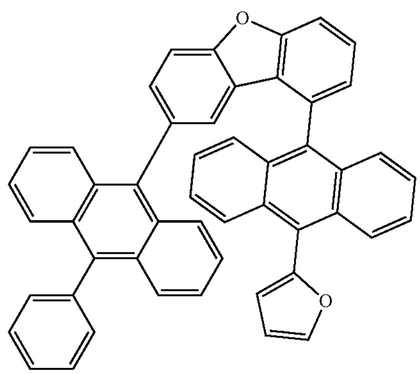
666
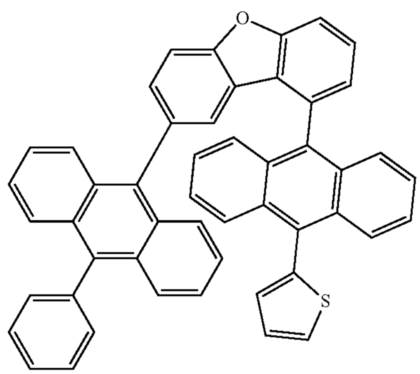
667
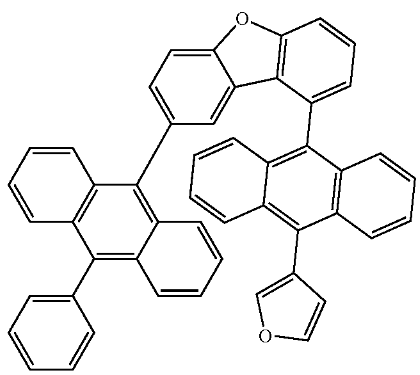
668
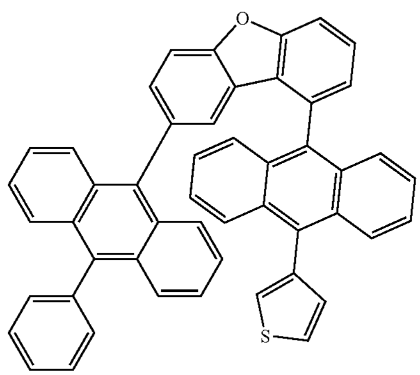
669
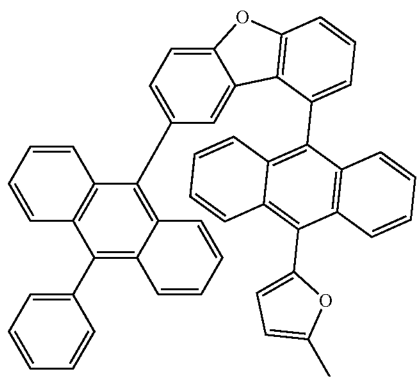
670
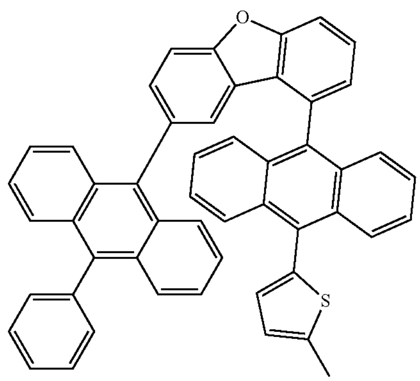
671
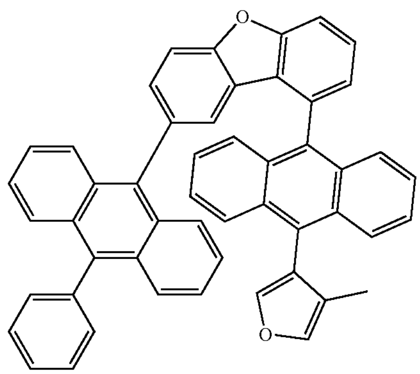
672
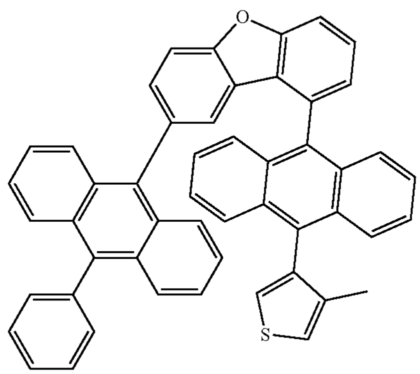

-continued
673
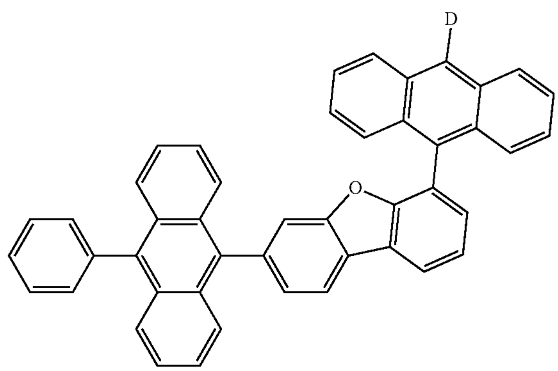
674
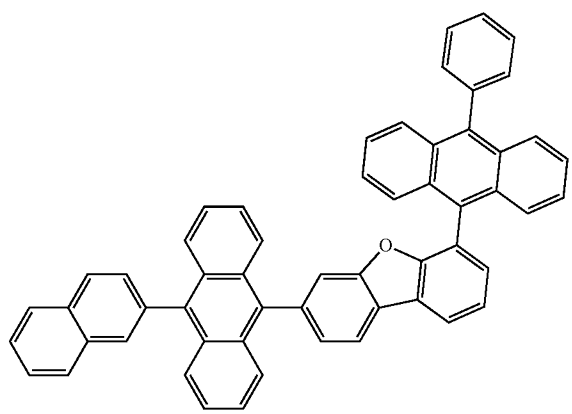
675
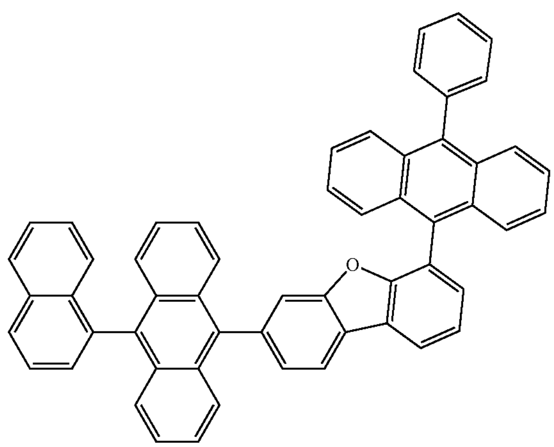
676
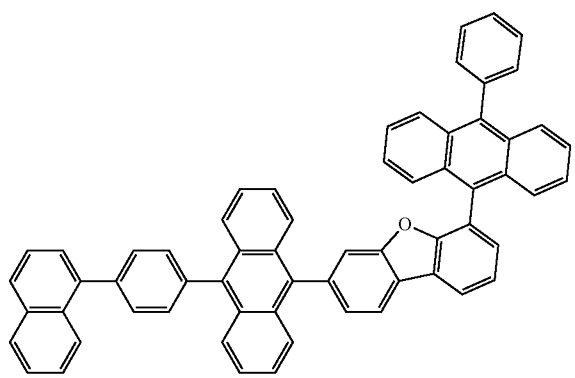
677
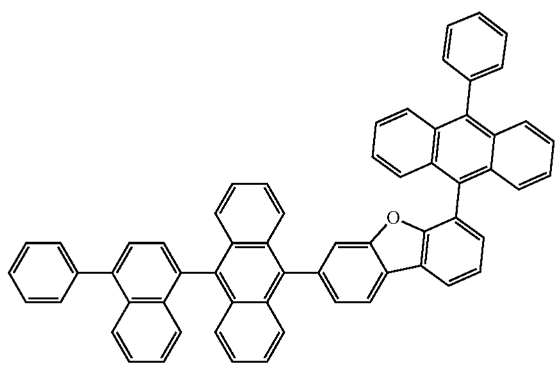
678
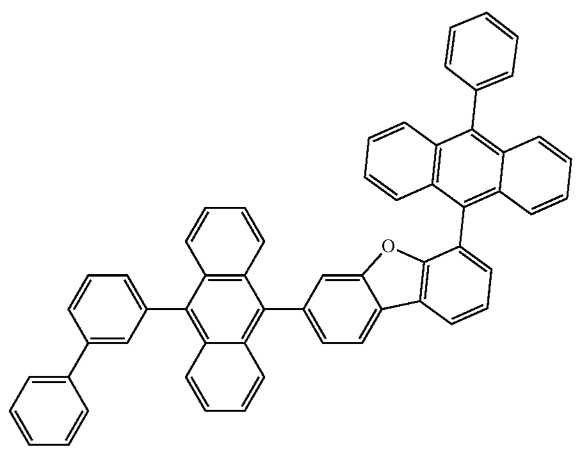

-continued
679
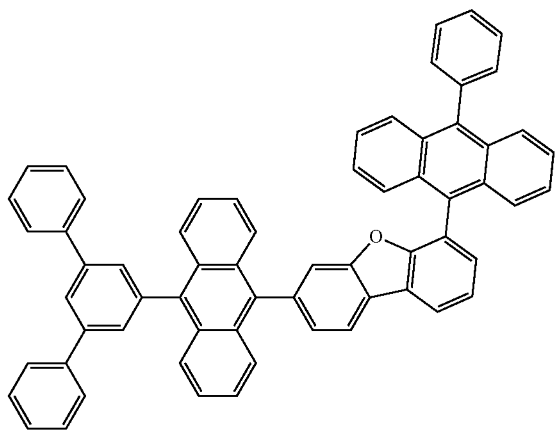
680
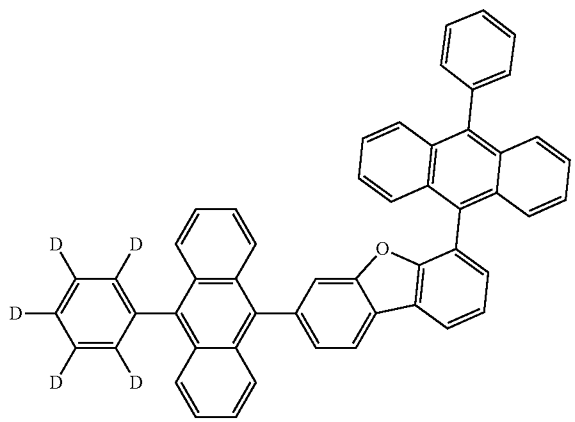
681
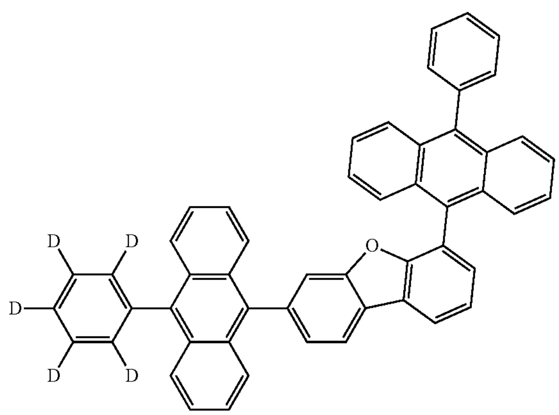
682
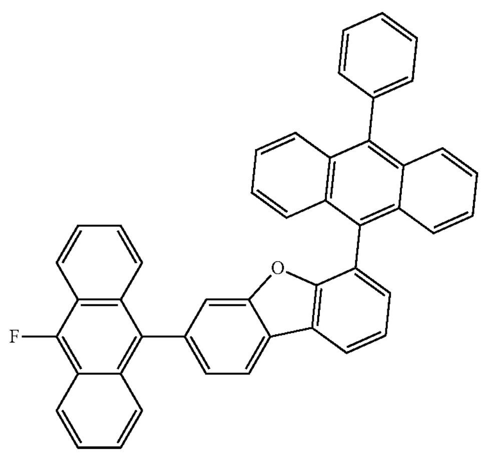
683
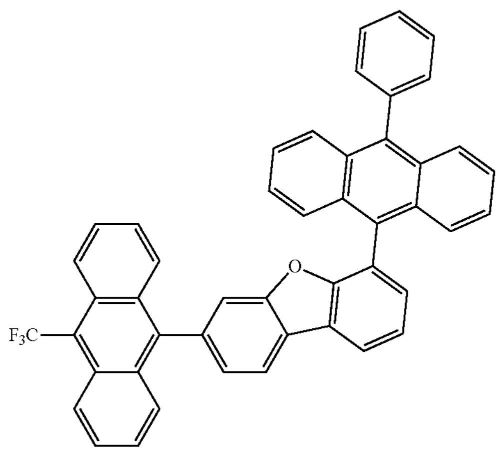
684
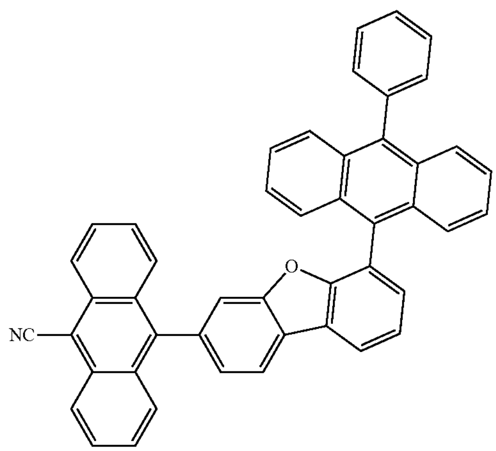

-continued
685
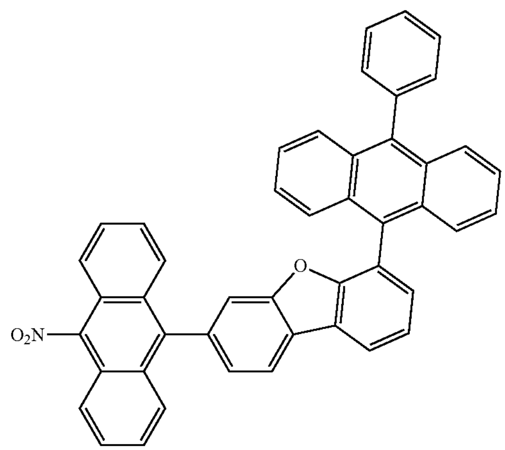
686
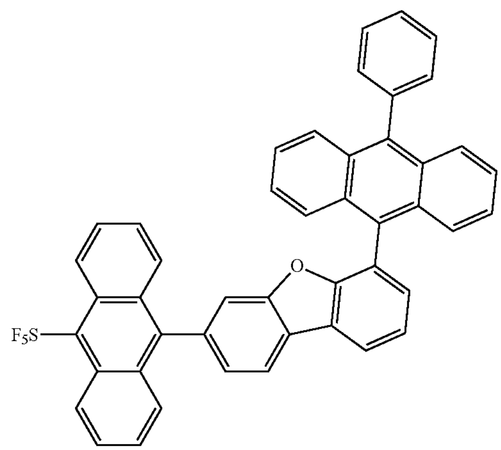
687
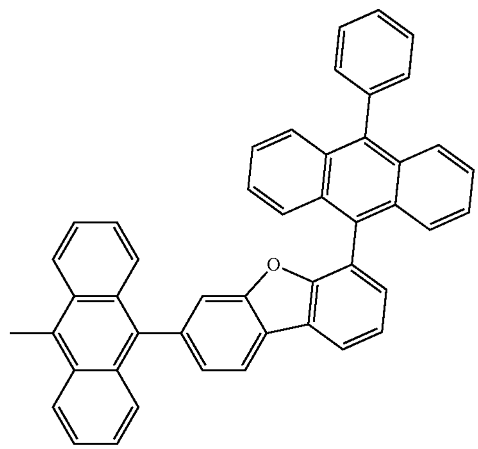
688
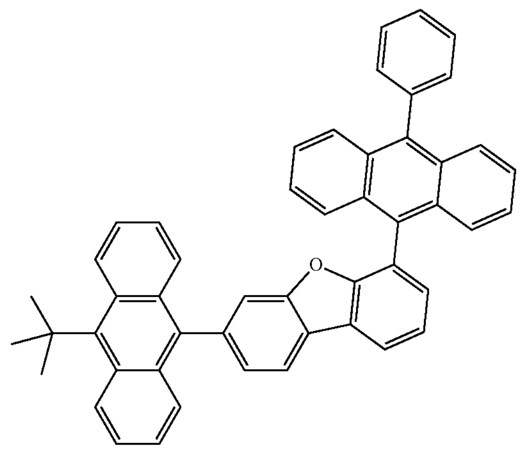
689
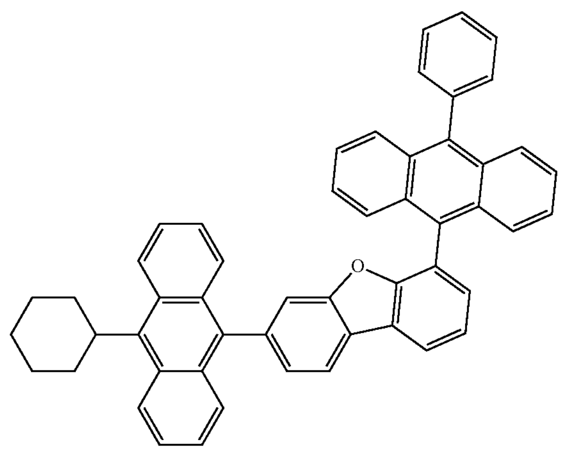
690
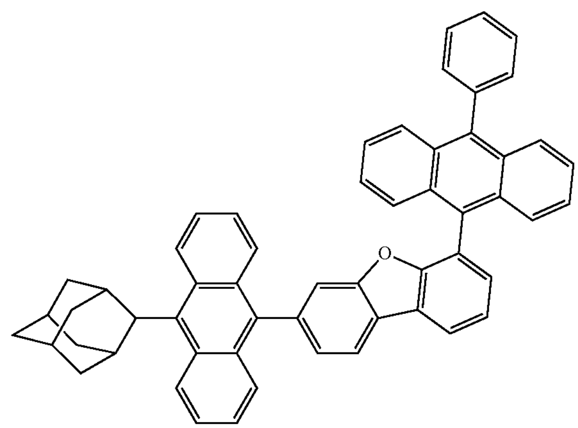

-continued
691
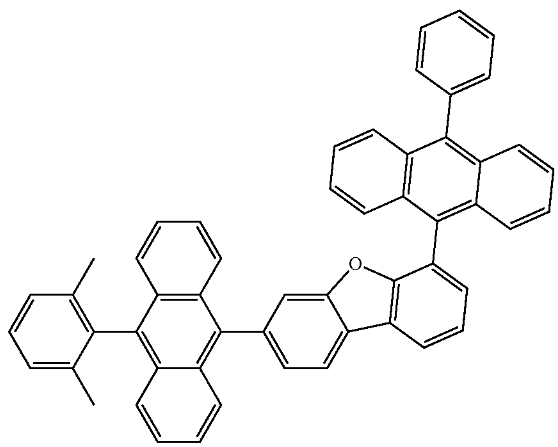
692
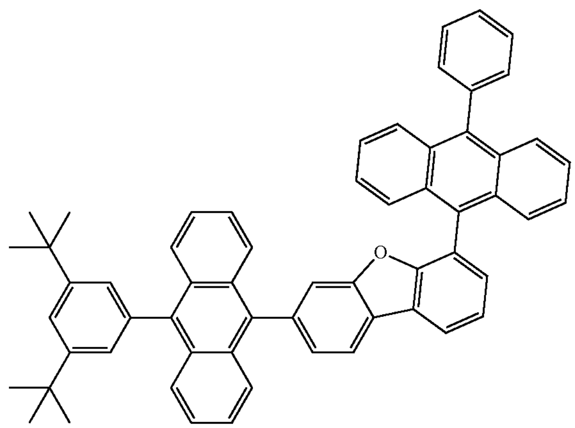
693
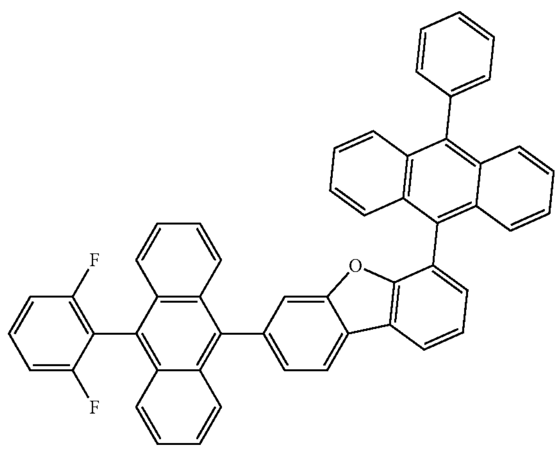
694
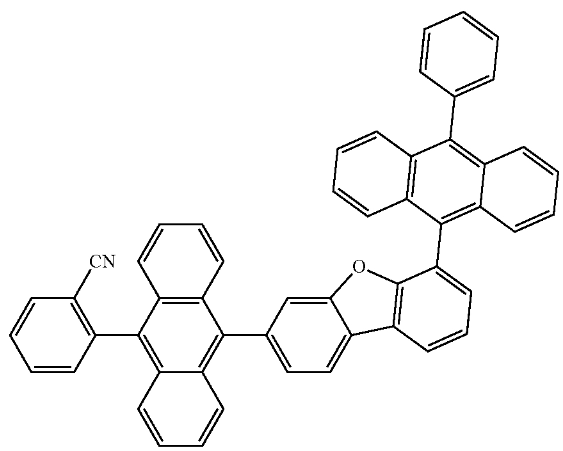
695
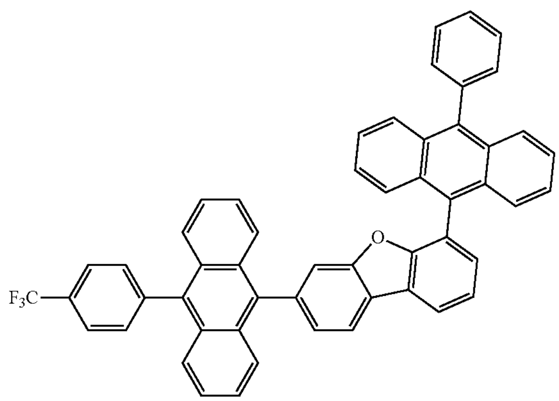
696
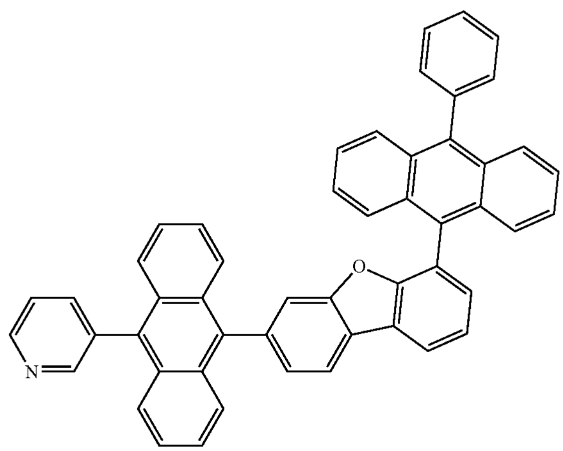

-continued
697
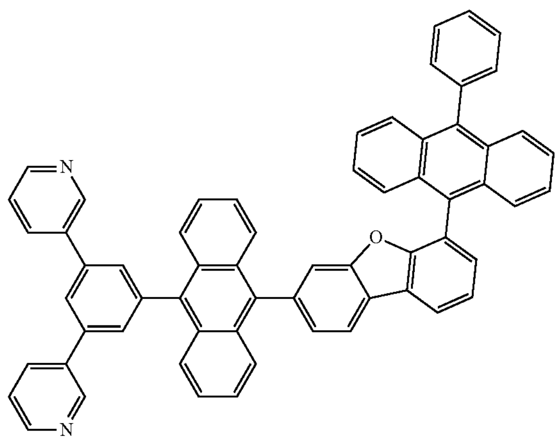
698
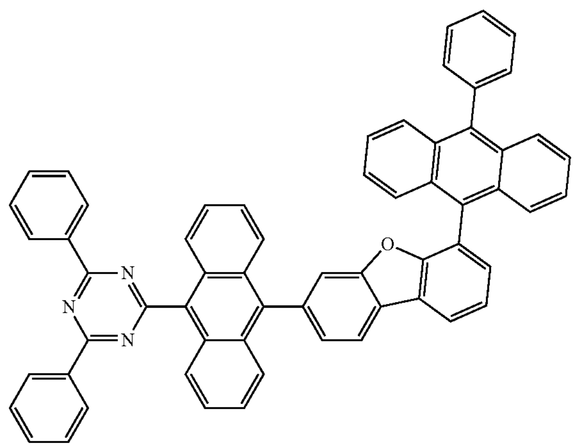
699
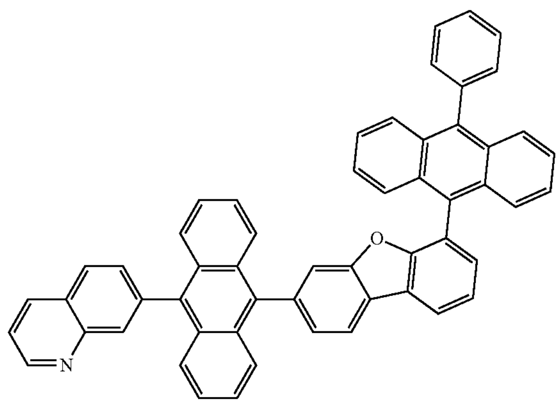
700
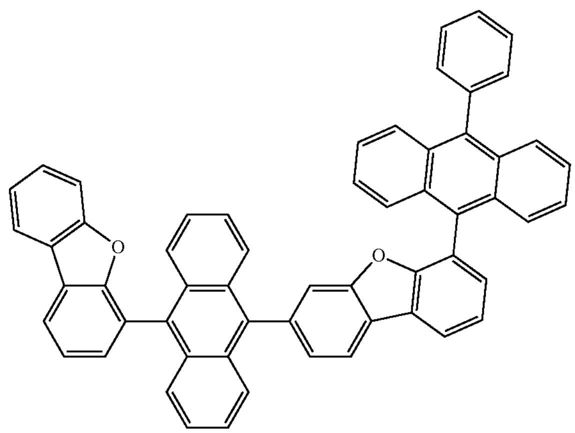
701
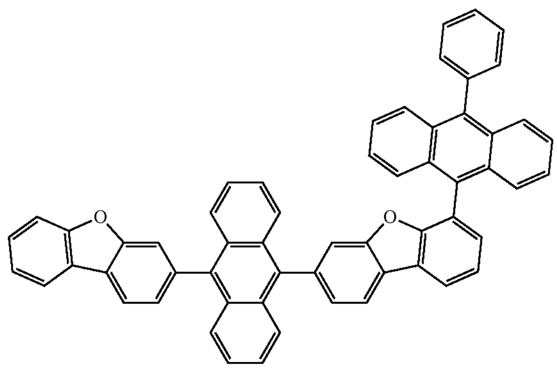
702
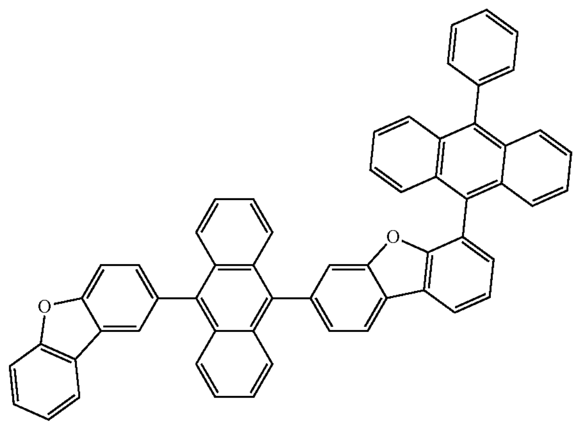

-continued
703
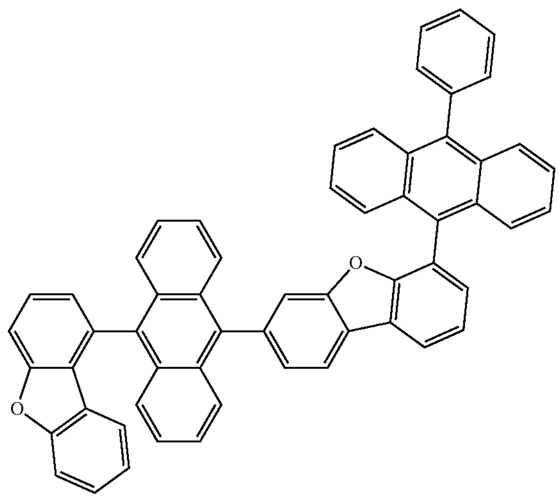
704
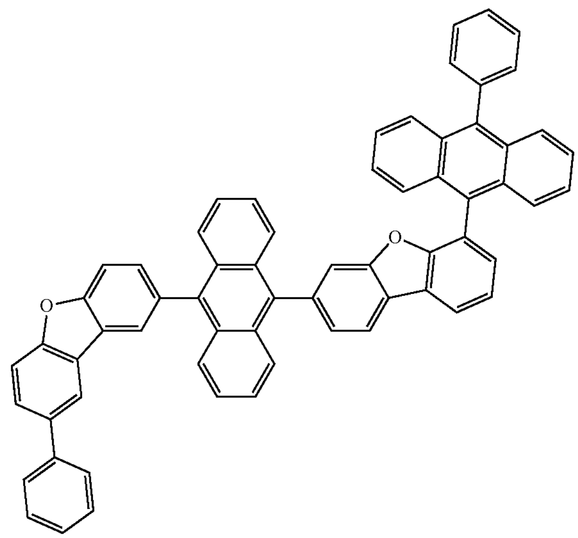
705
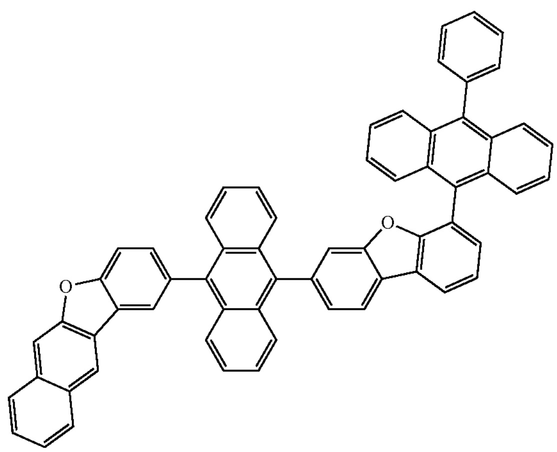
706
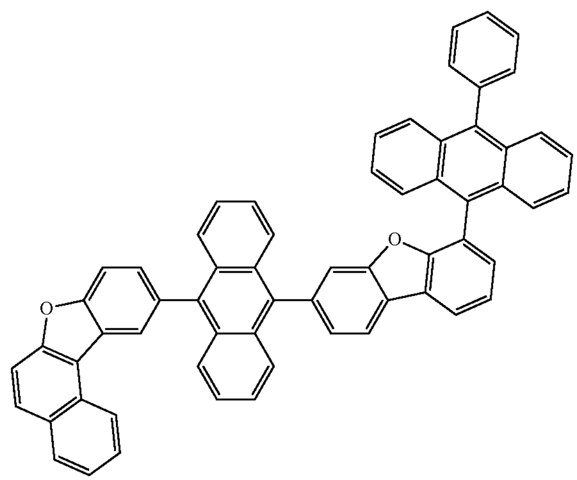
707
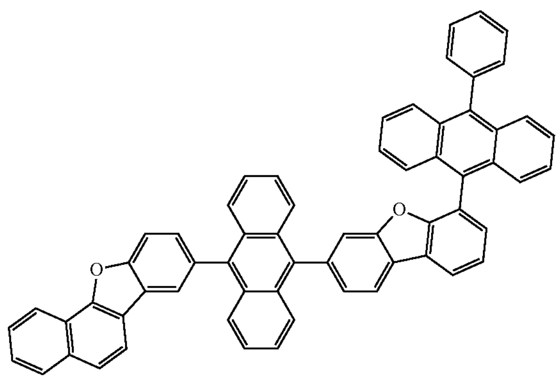
708
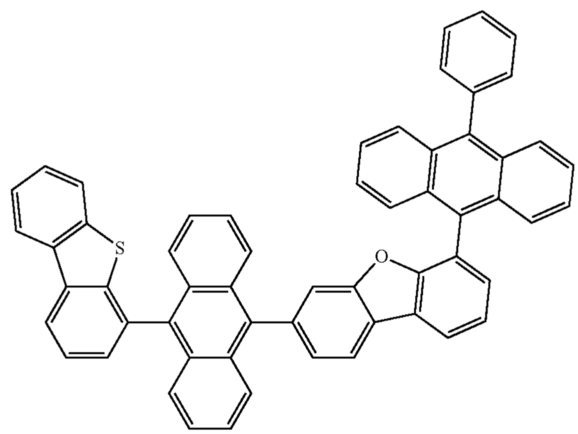

-continued
709
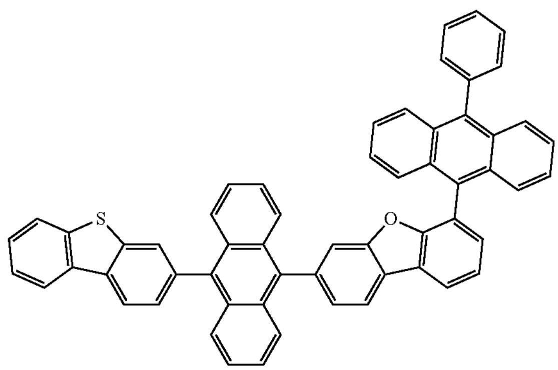
710
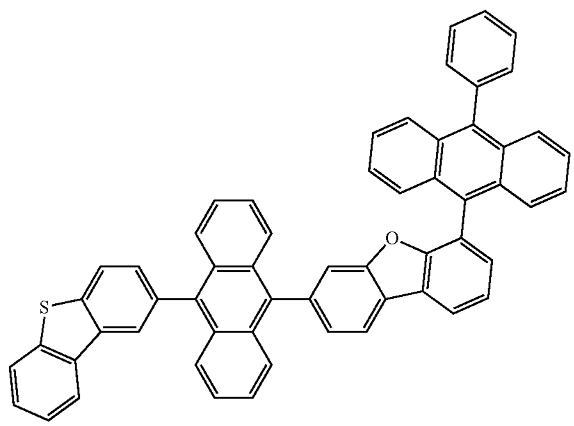
711
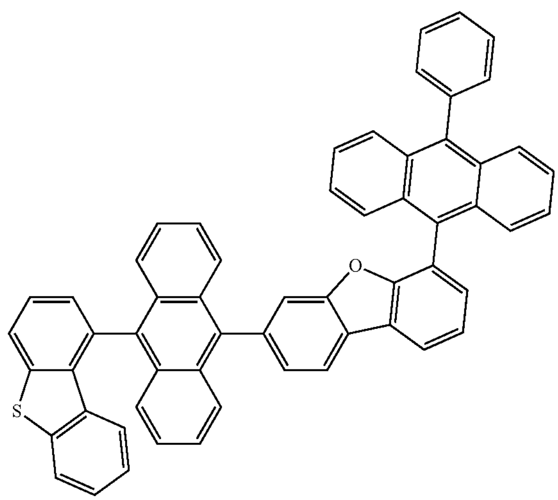
712
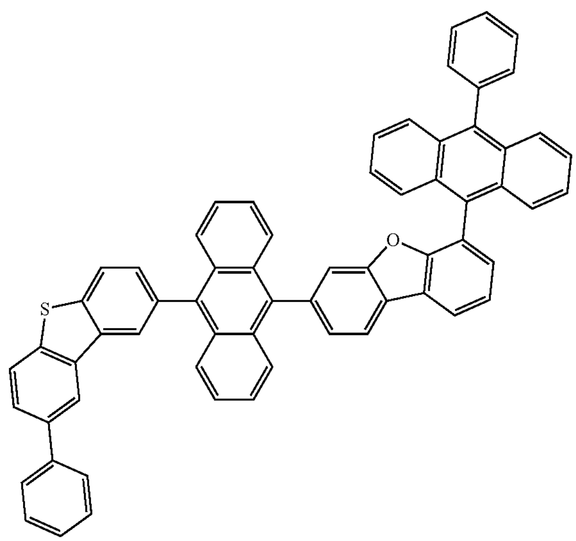
713
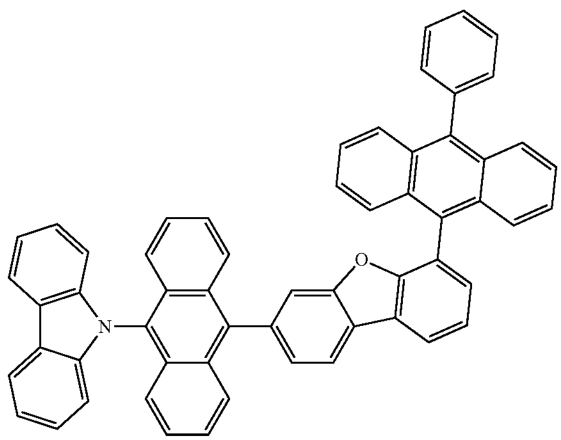
714
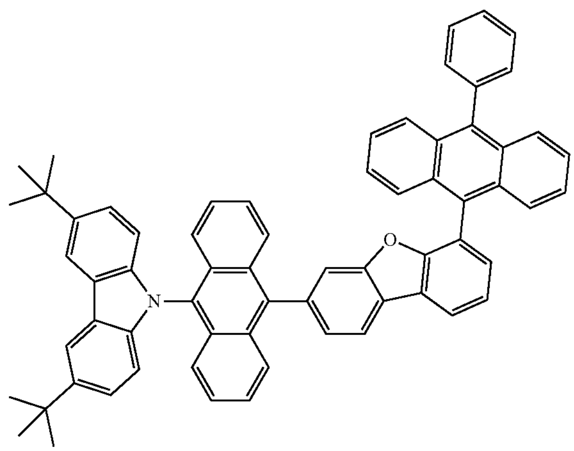

-continued
715
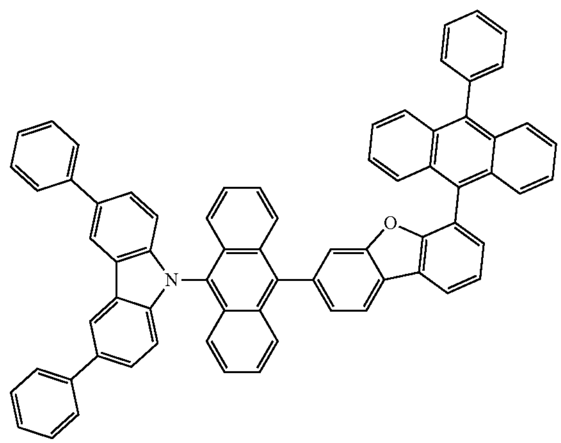
716
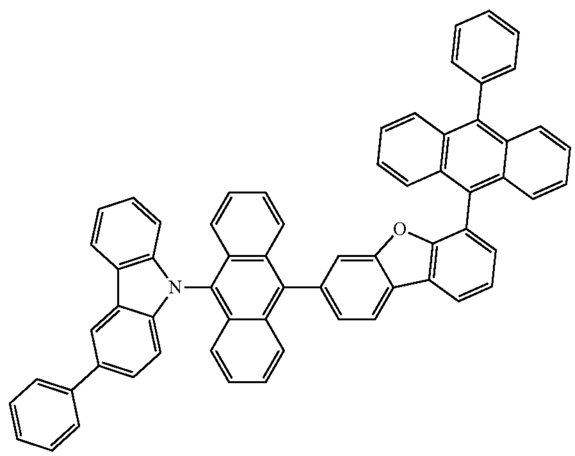
717
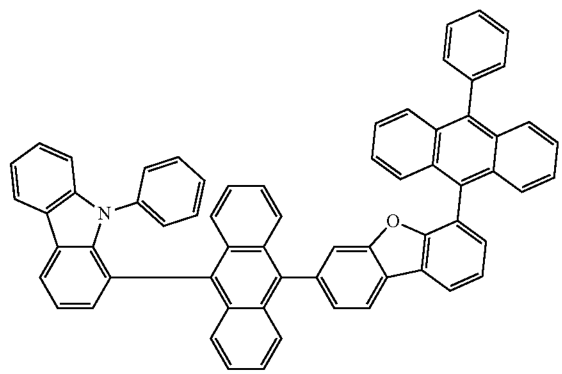
718
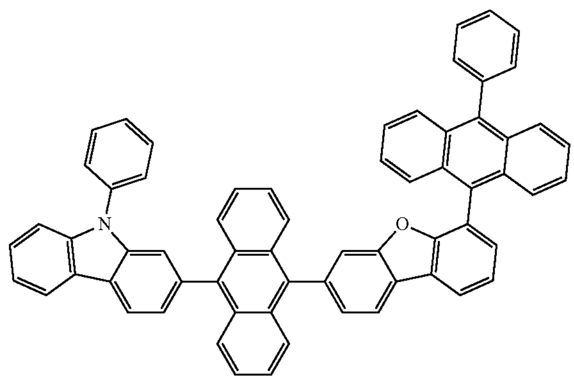
719
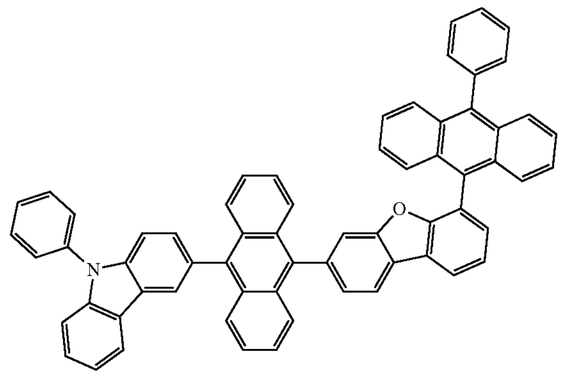
720
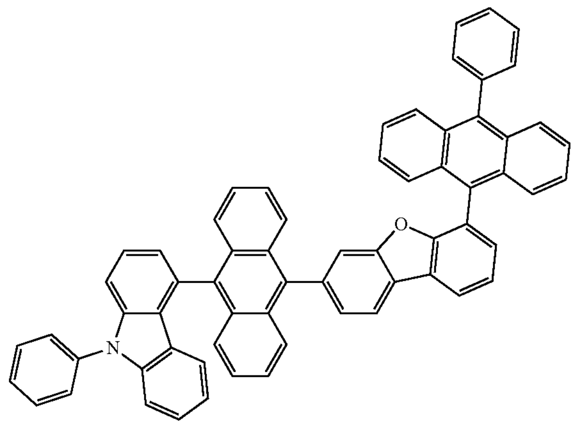

-continued
721
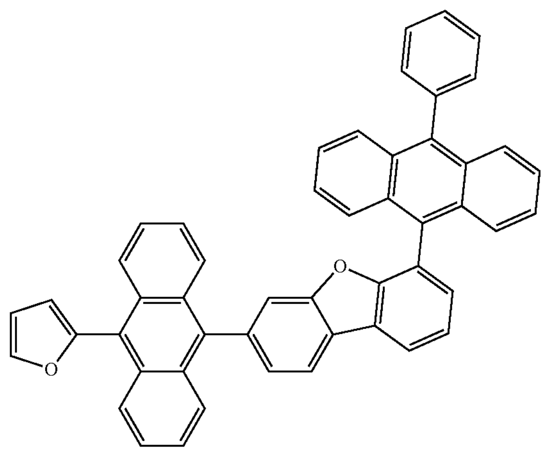
722
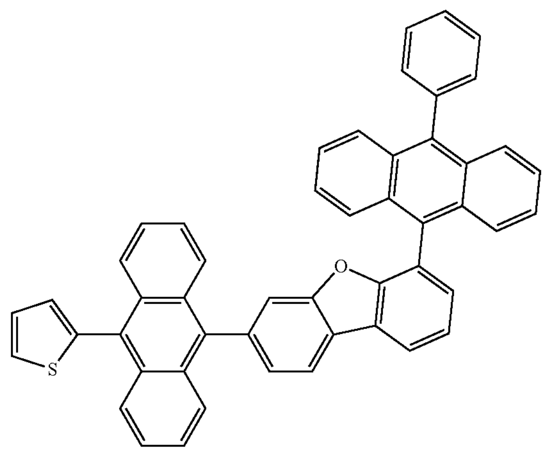
723
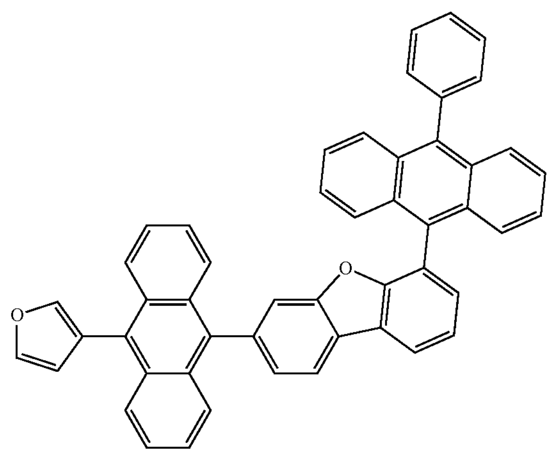
724
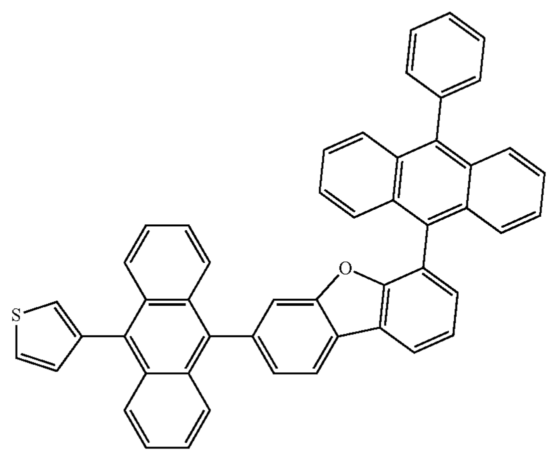
725
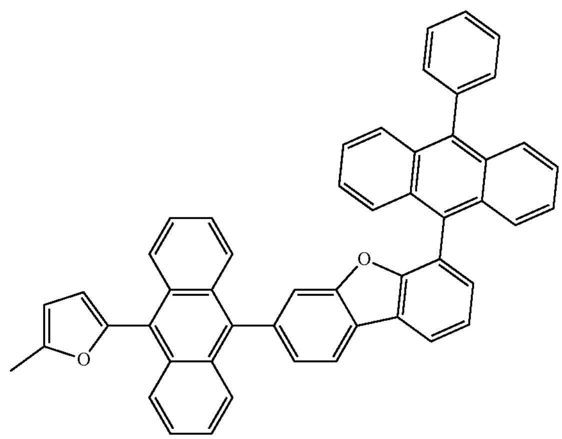
726
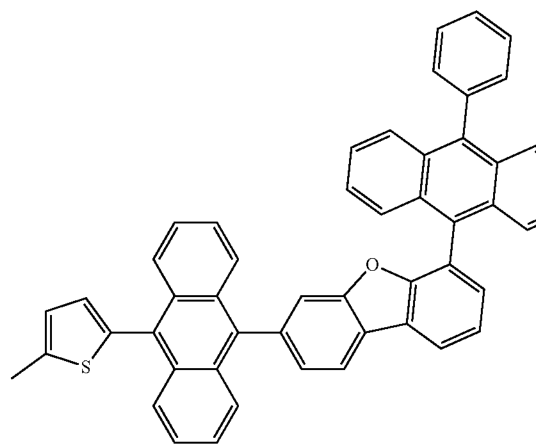

-continued
727
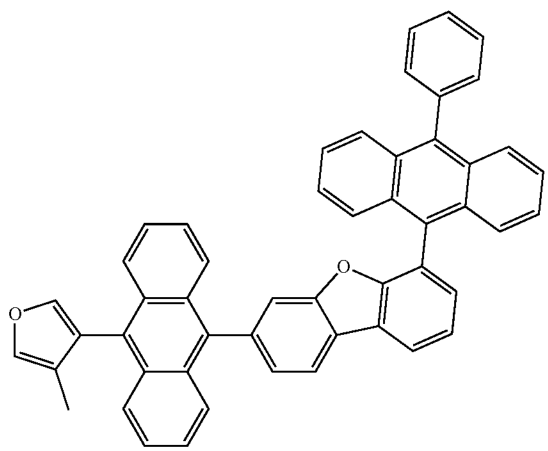
728
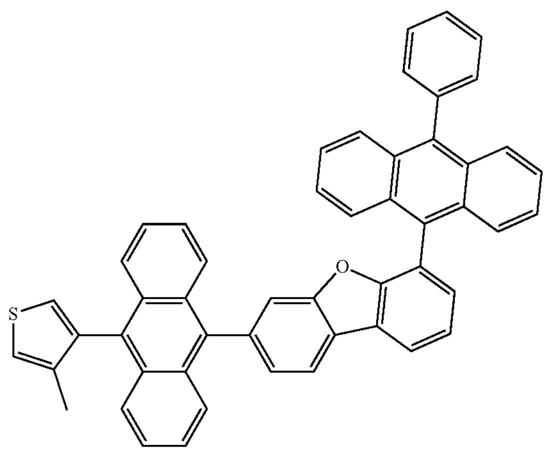
729
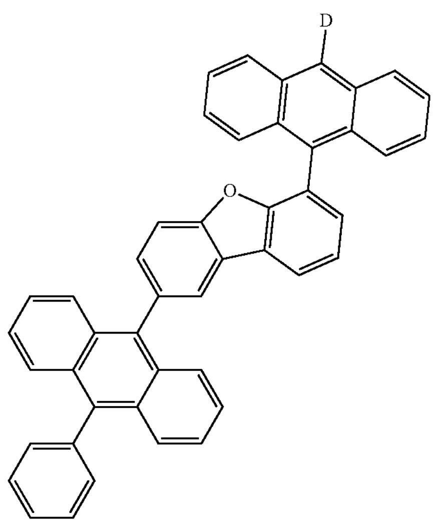
730
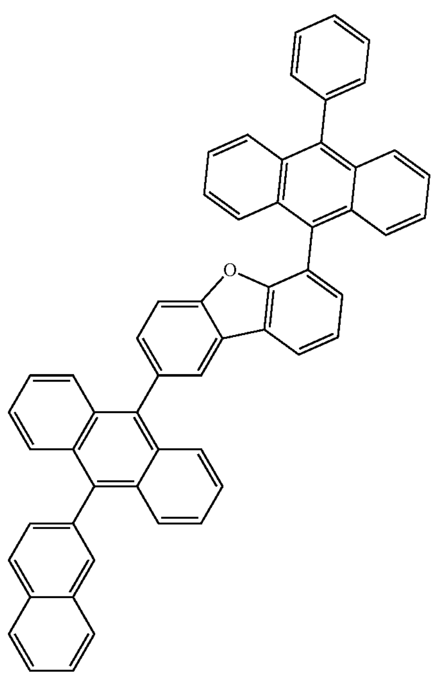

-continued
731
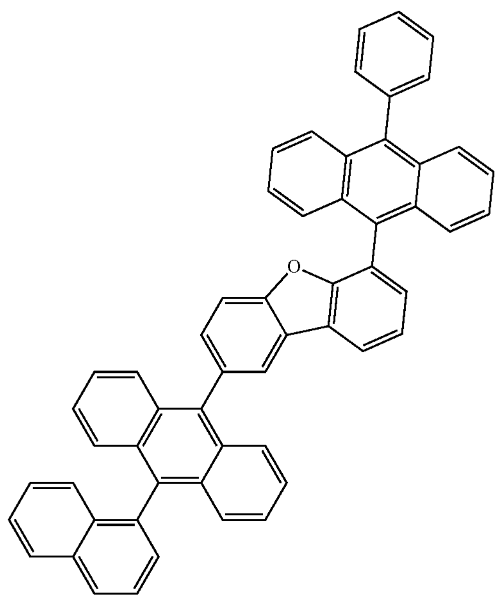
732
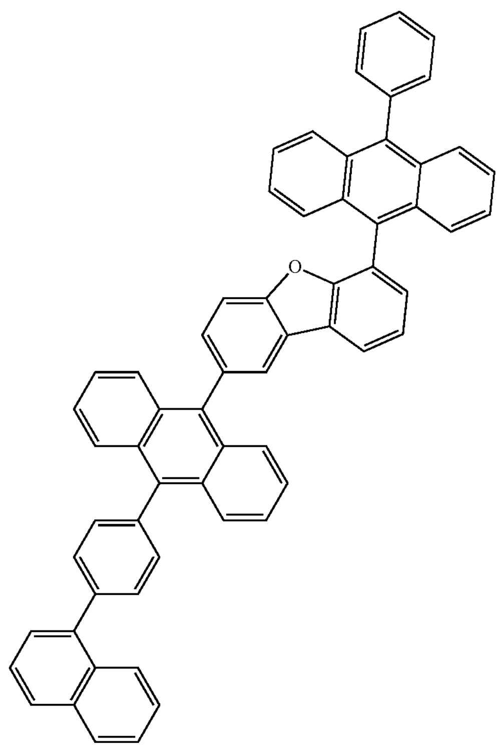
733
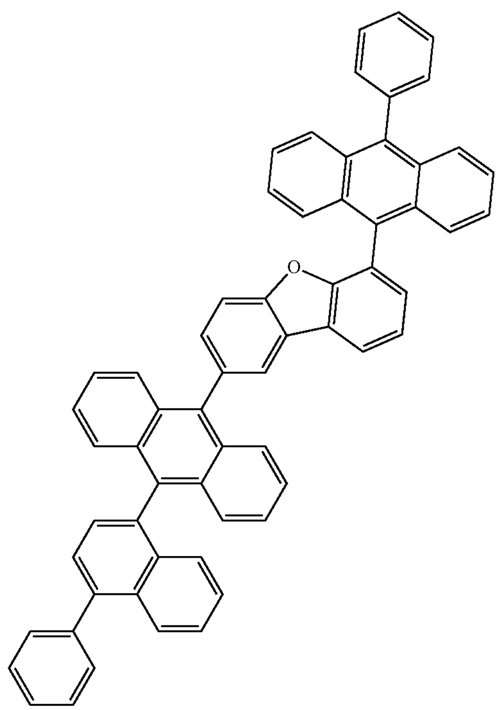
734
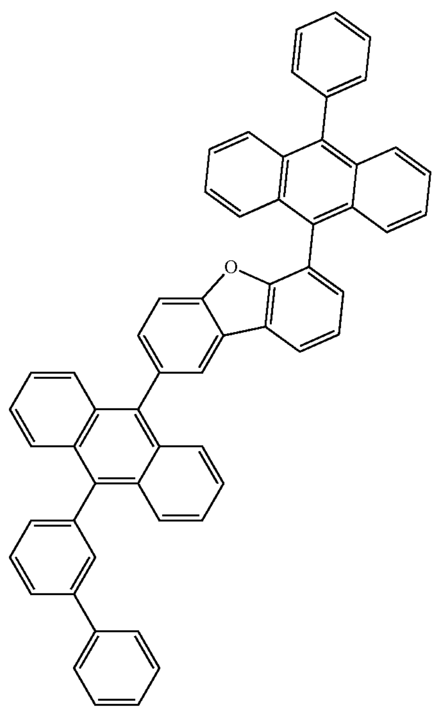

-continued
735
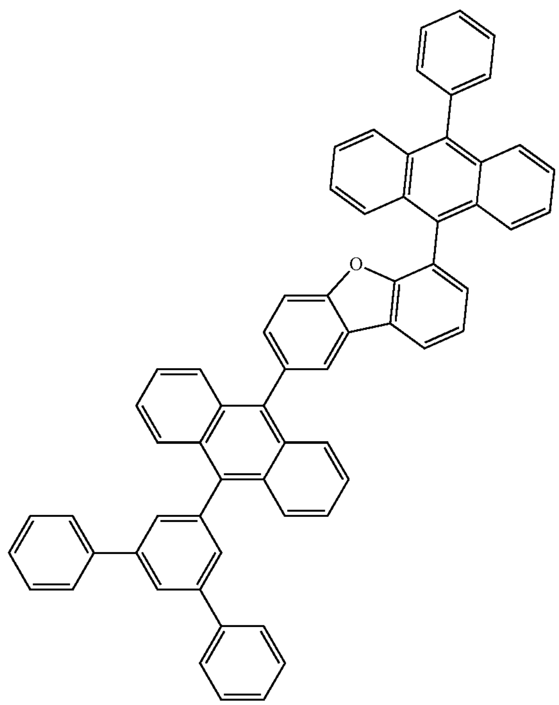
736
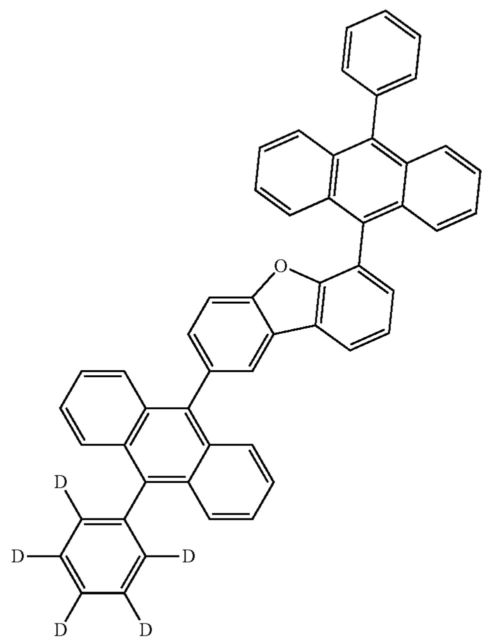
737
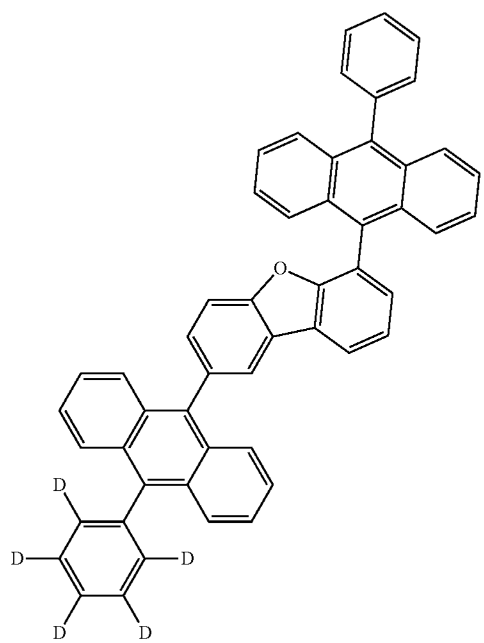
738
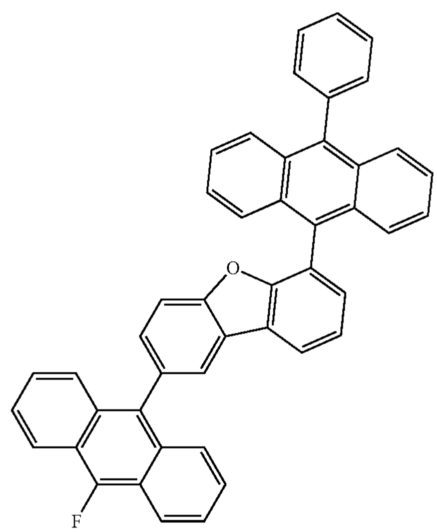

-continued
739
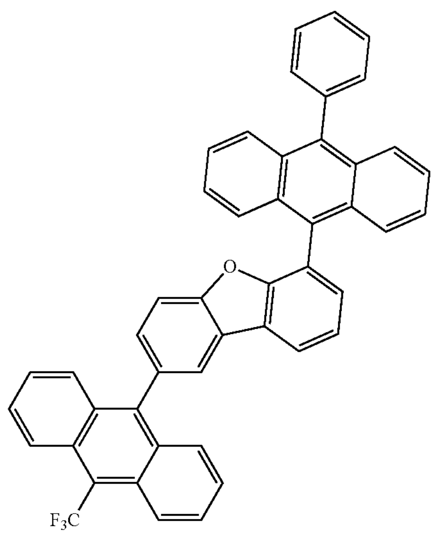
740
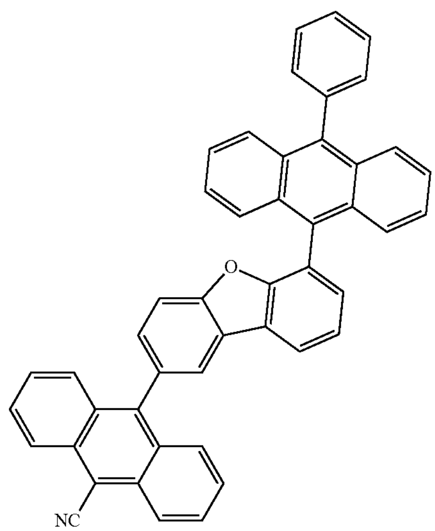
741
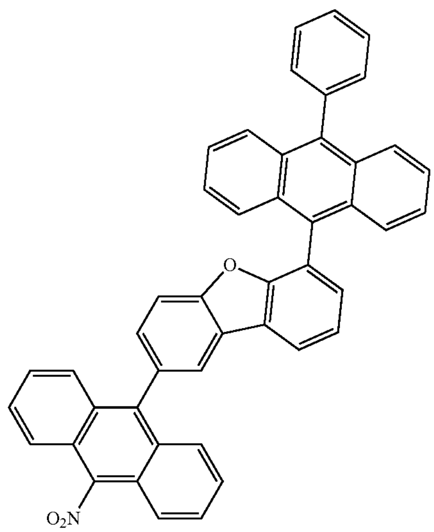
742
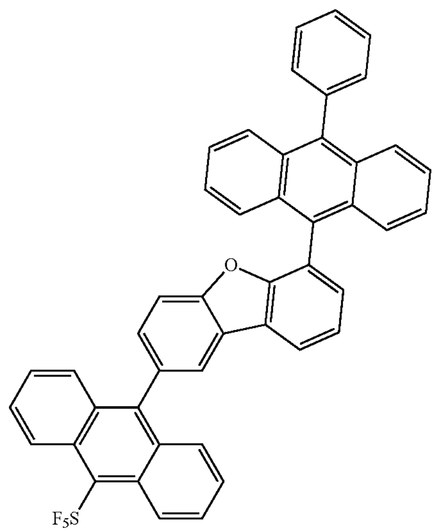
743
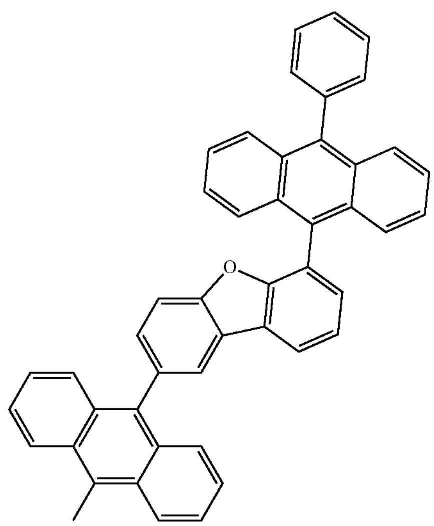
744
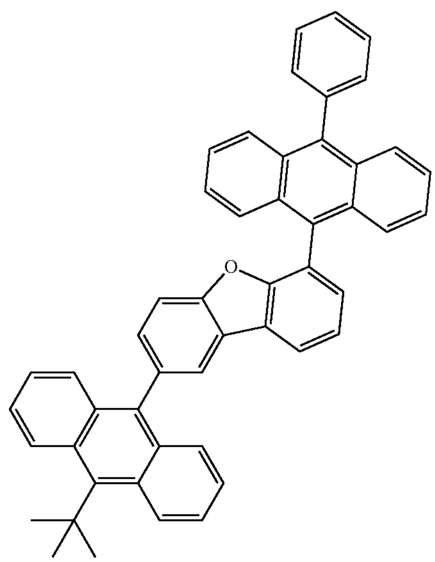

-continued
745
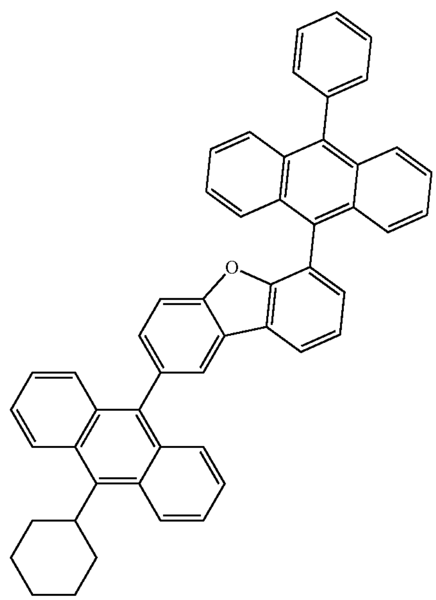
746
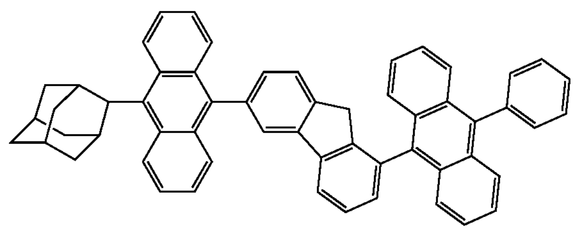
747
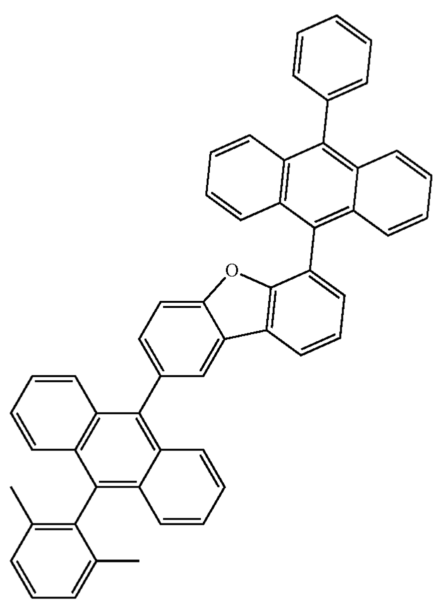
748
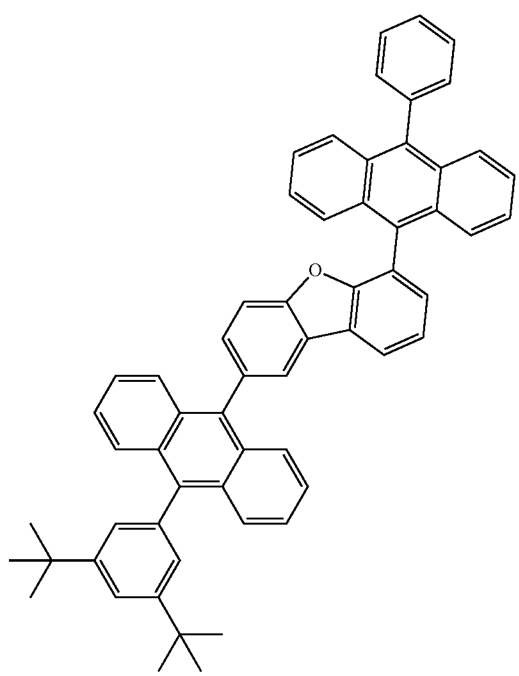

-continued
749
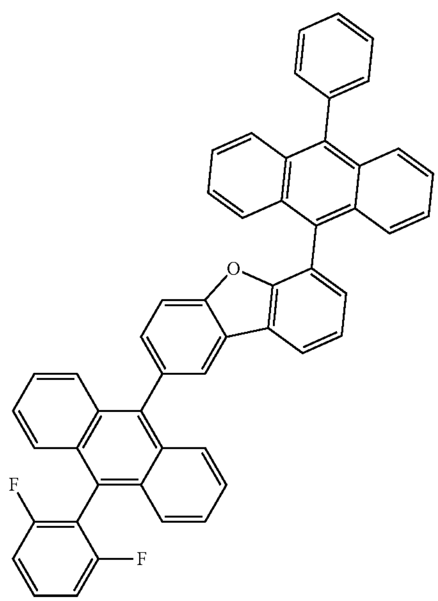
750
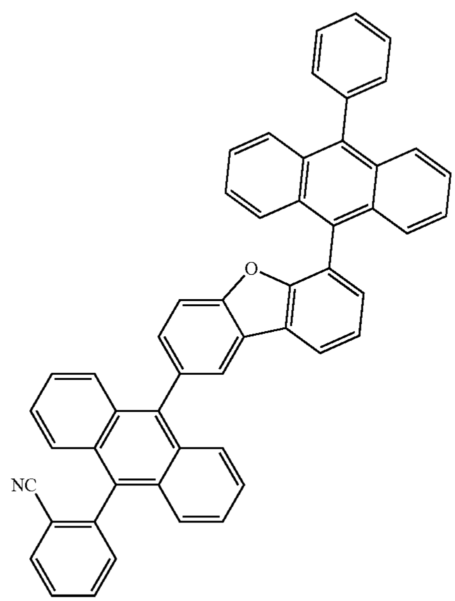
751
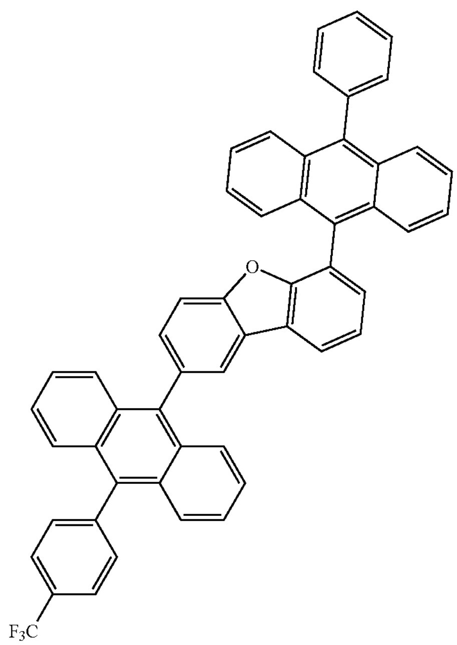
752
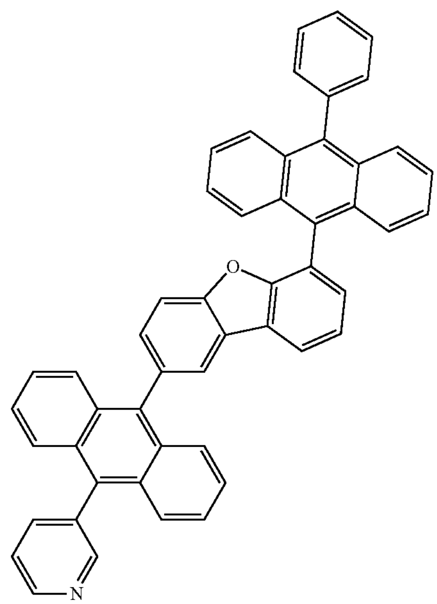

-continued
753
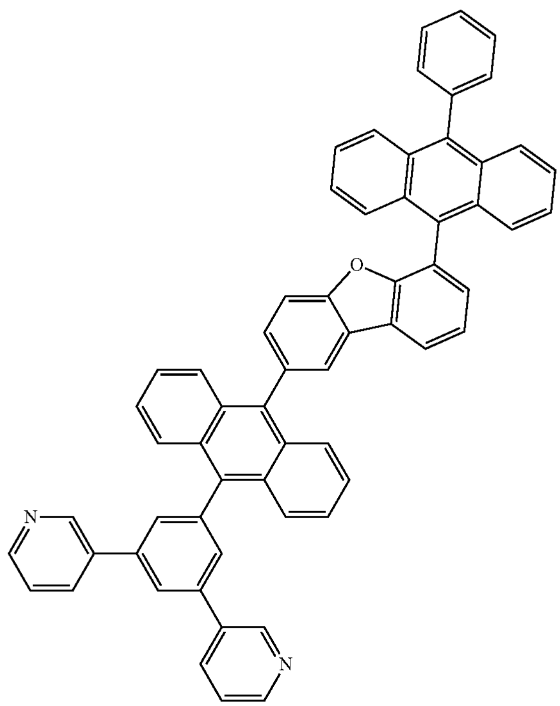
754
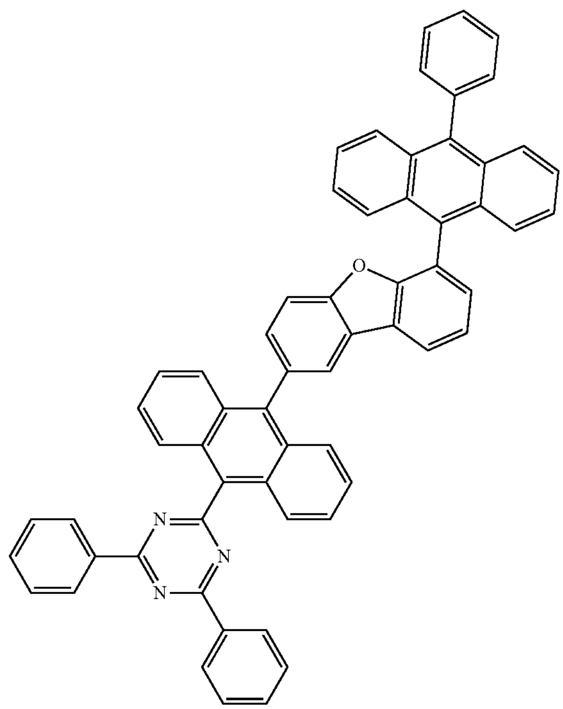
755
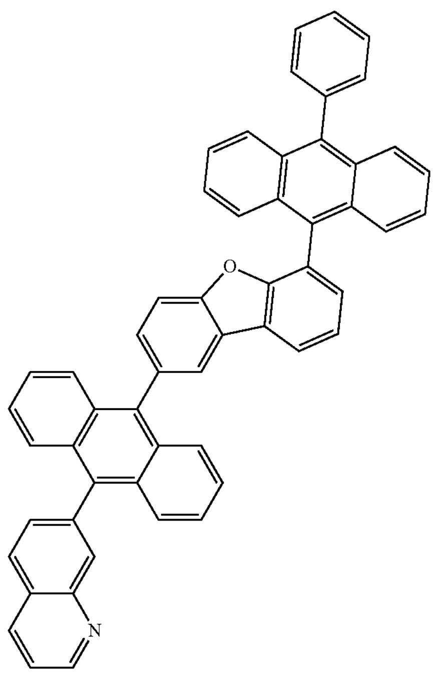
756
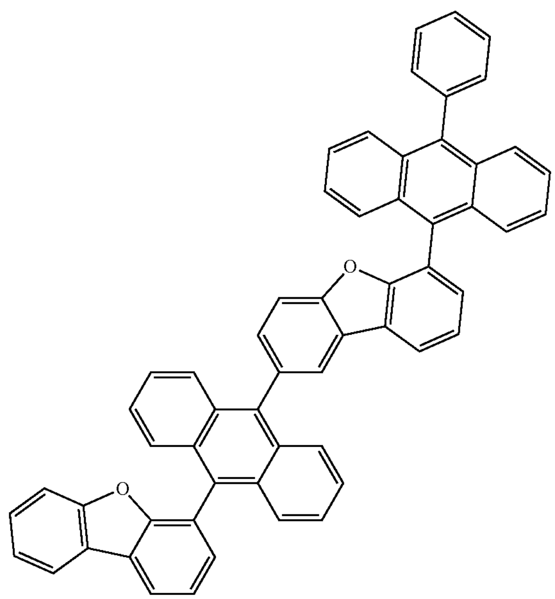

-continued
757
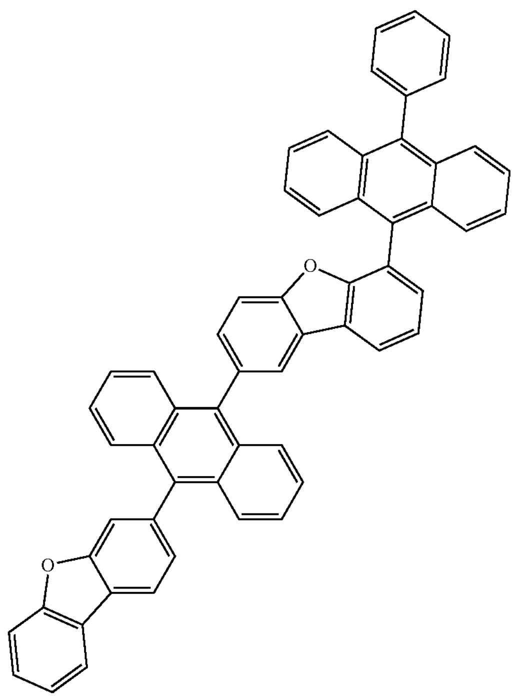
758
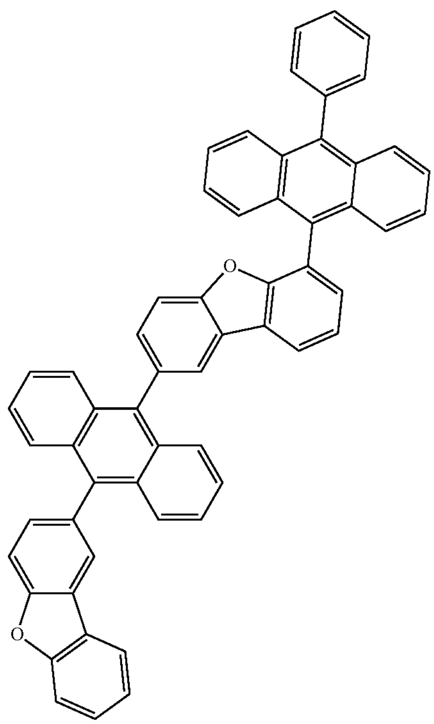
759
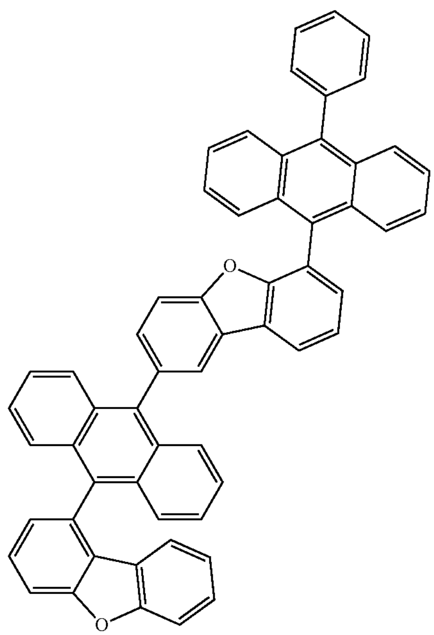
760
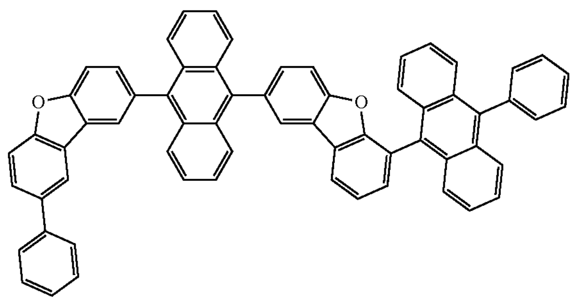

-continued
761
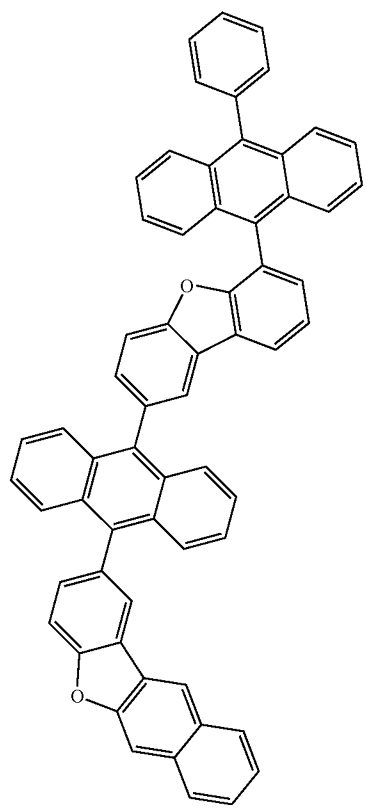
762
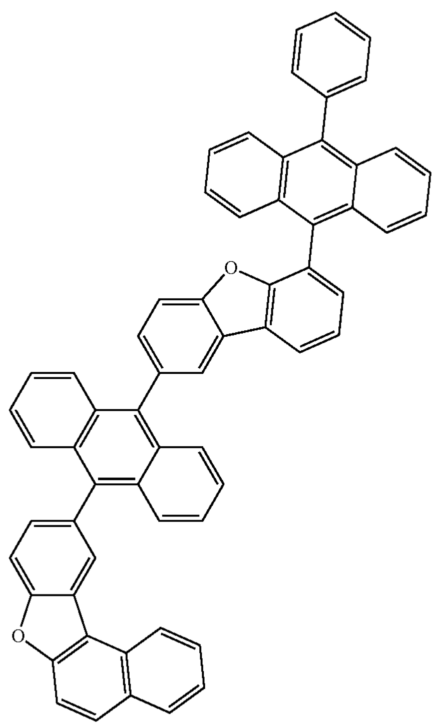
763
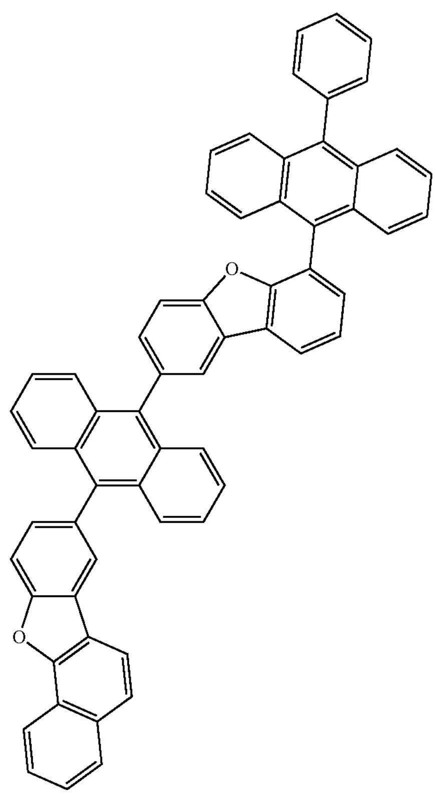
764
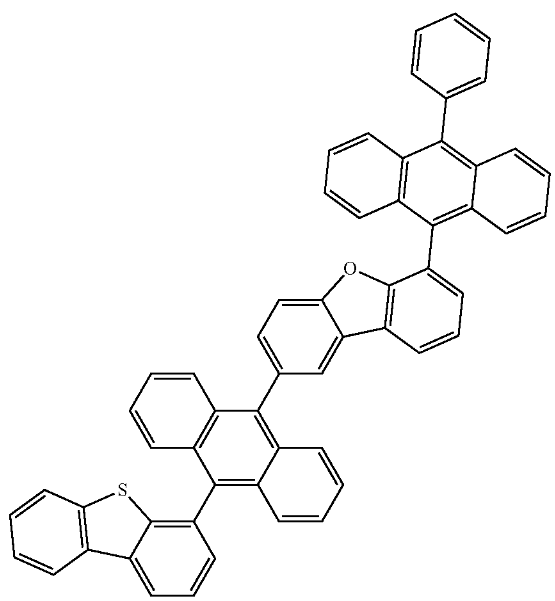

-continued
765
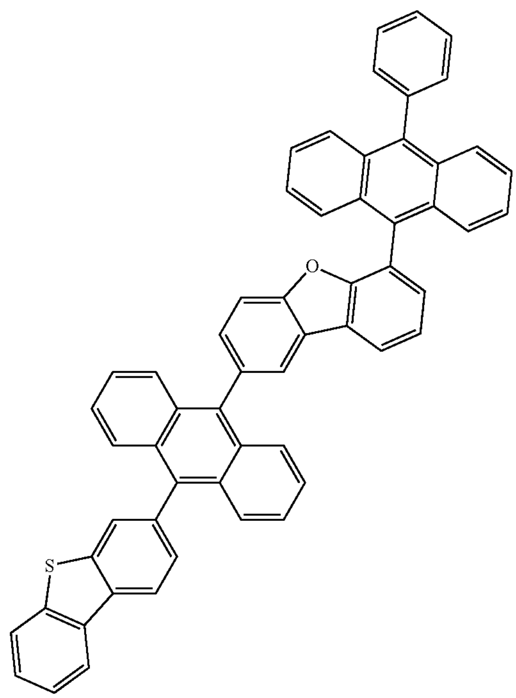
766
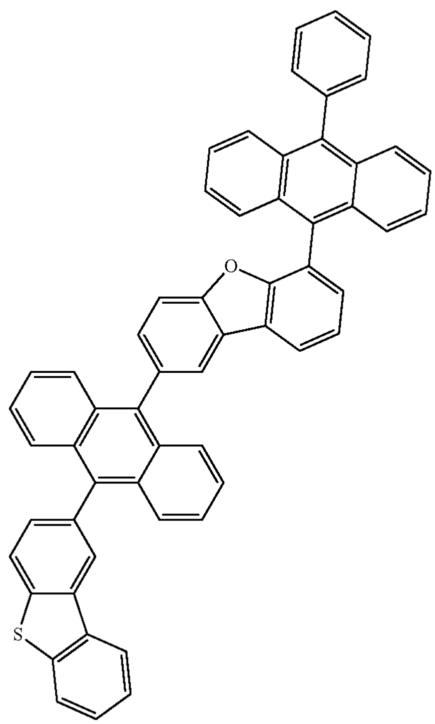
767
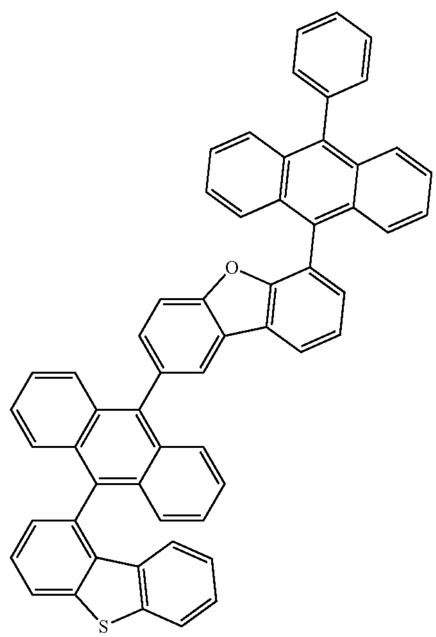
768
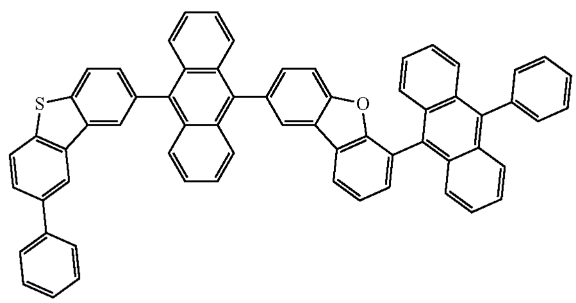

-continued
769
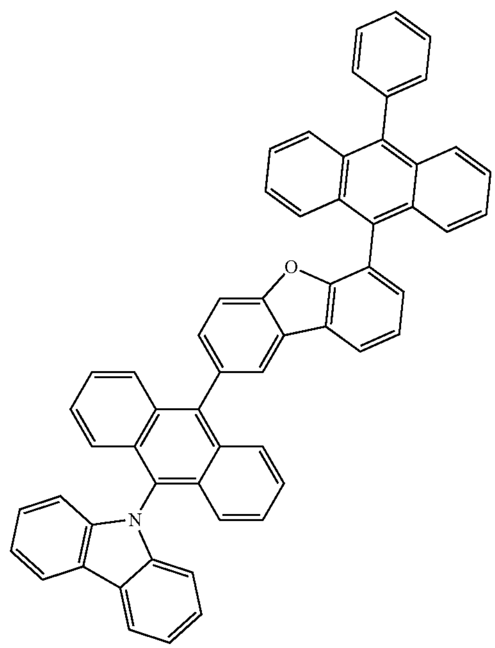
770
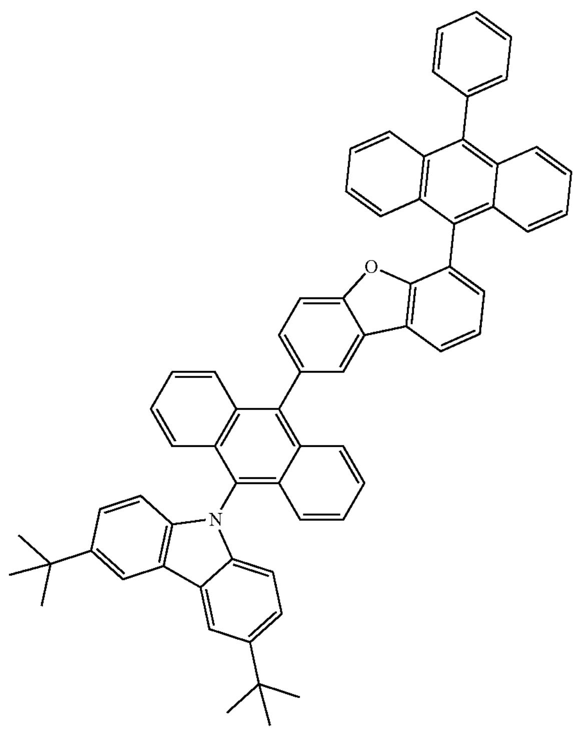
771
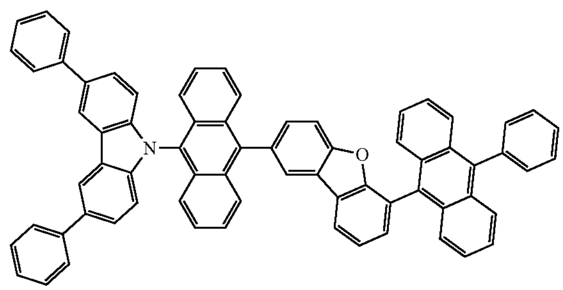
772
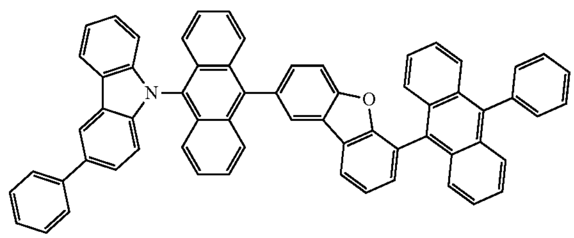
773
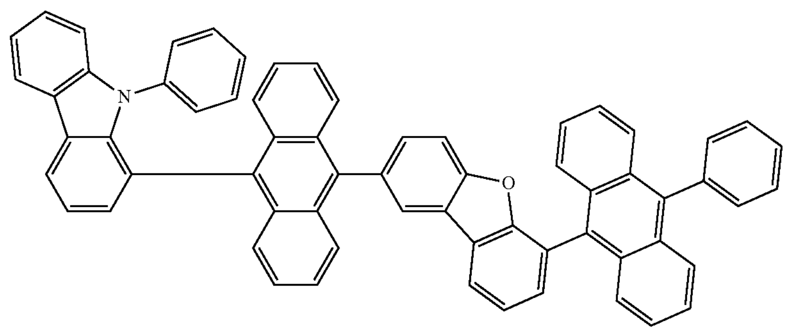

-continued
774
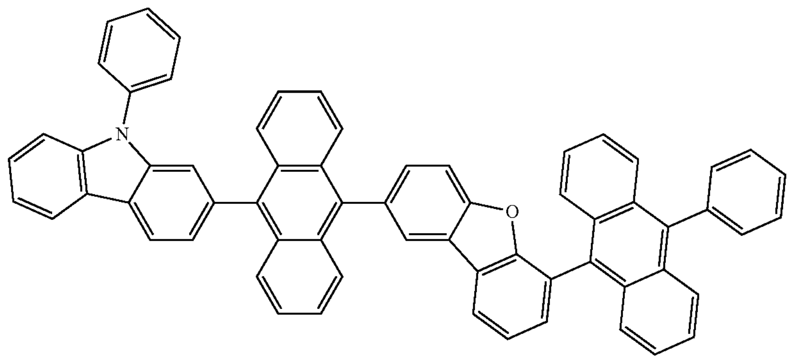
775
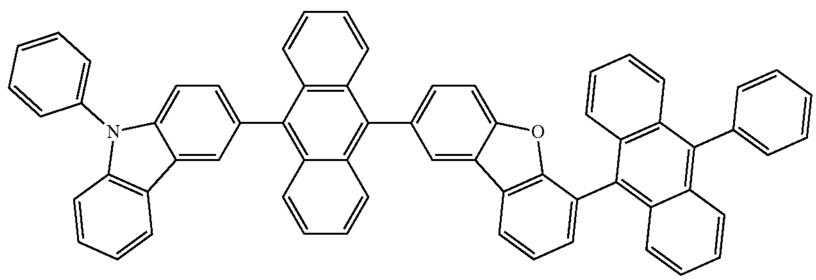
776
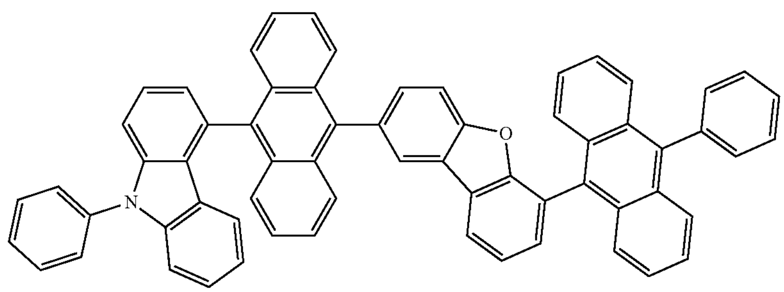
777
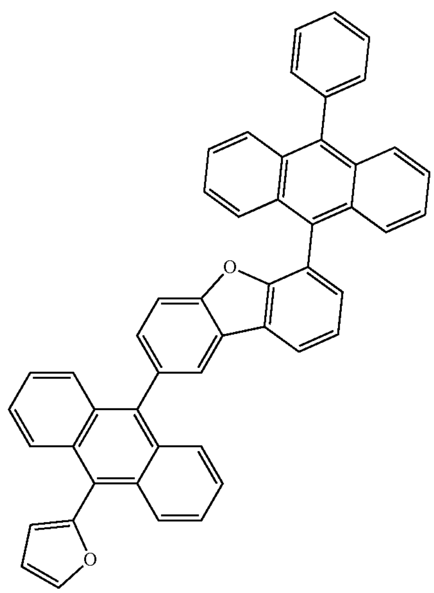
778
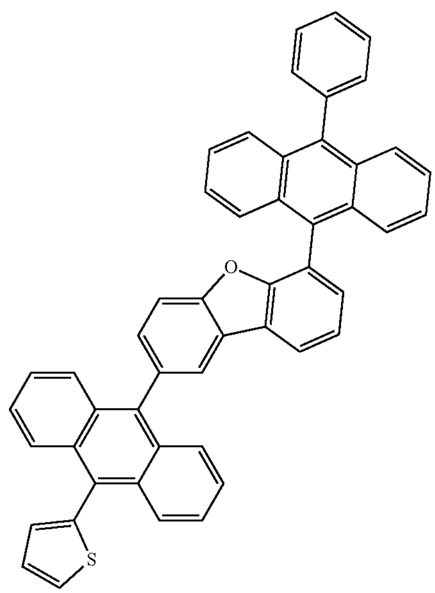

-continued
779
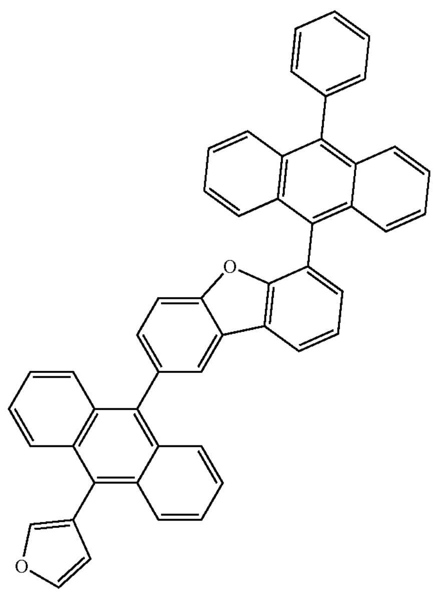
780
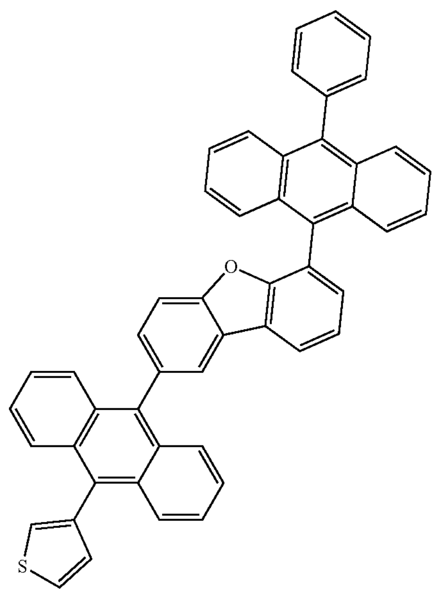
781
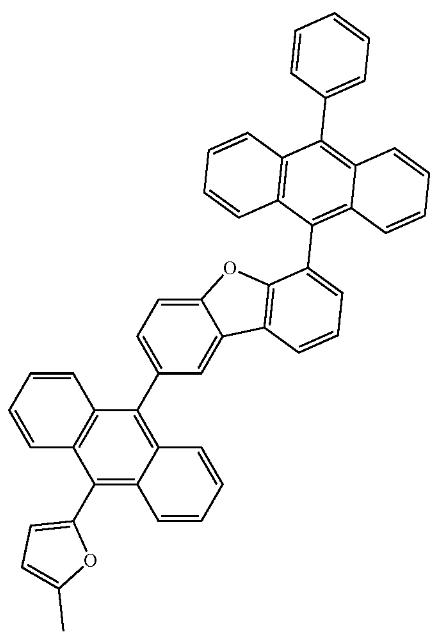
782
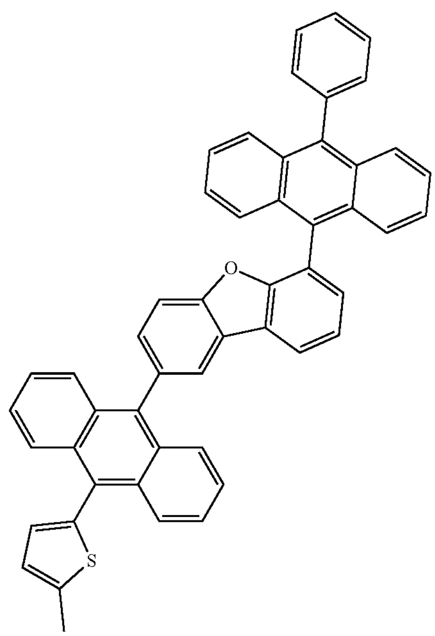

-continued
783
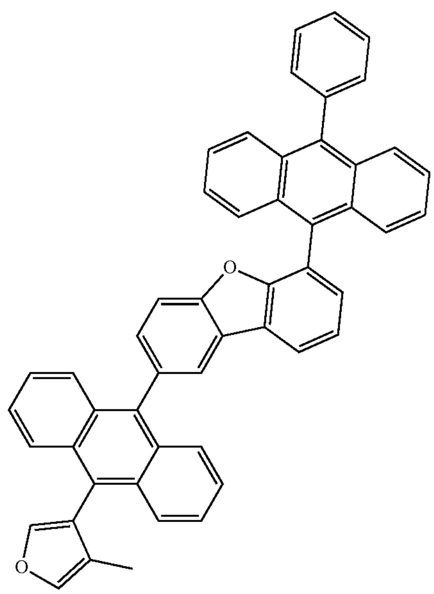
784
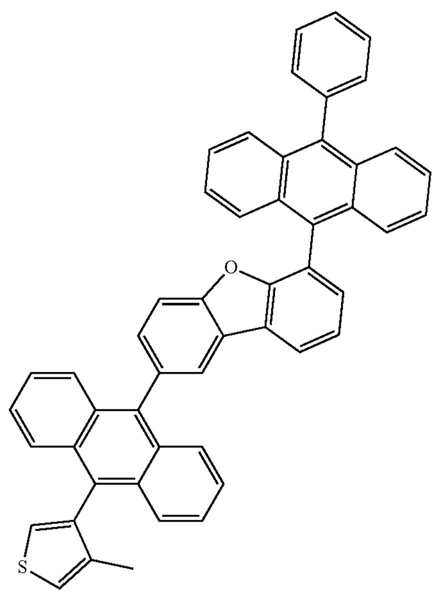
785
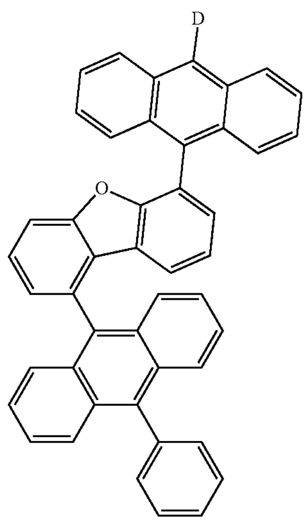
786
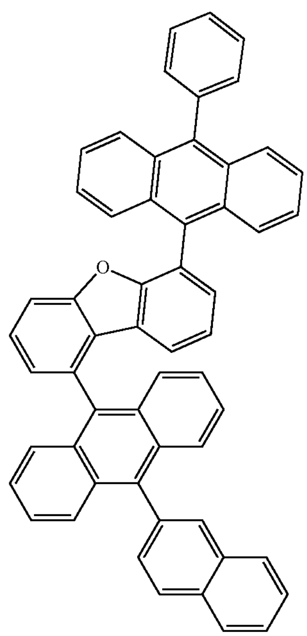

-continued
787
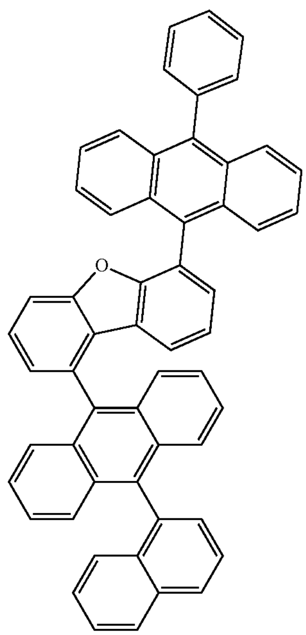
788
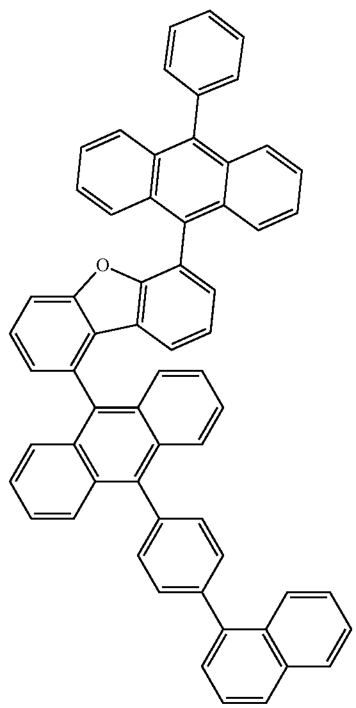
789
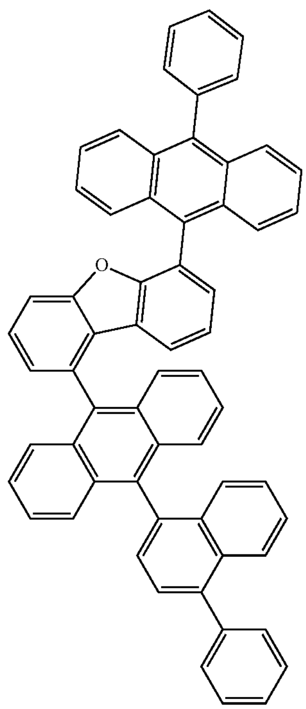
790
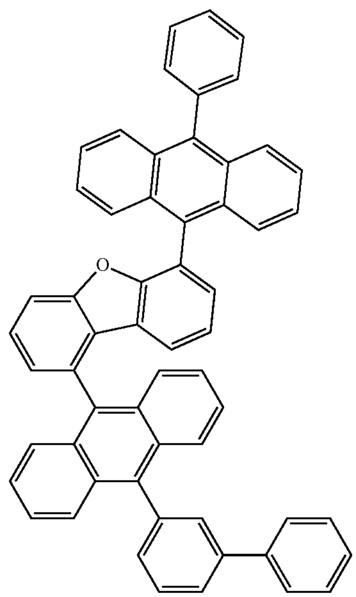

-continued
791
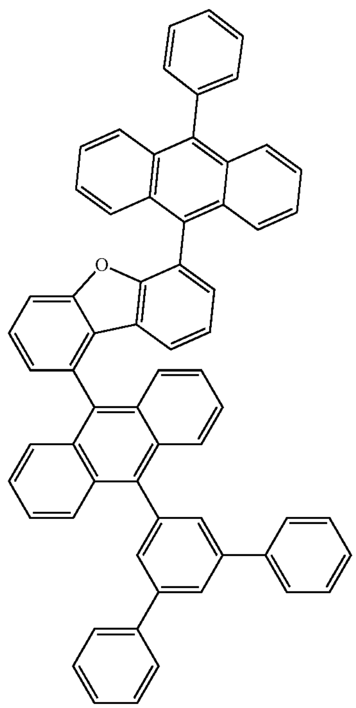
792
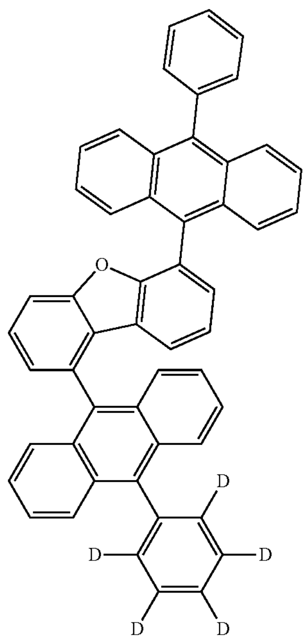
793
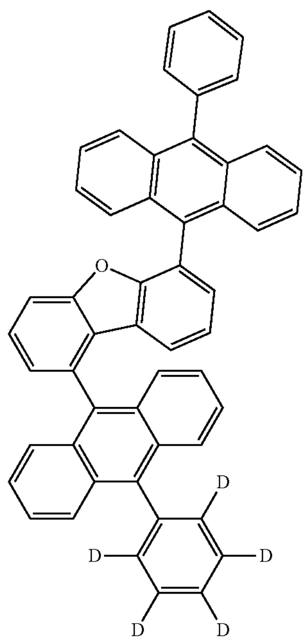
794
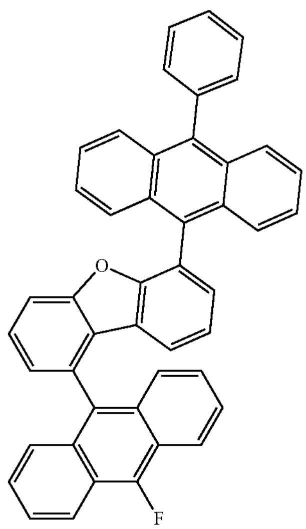

-continued
795
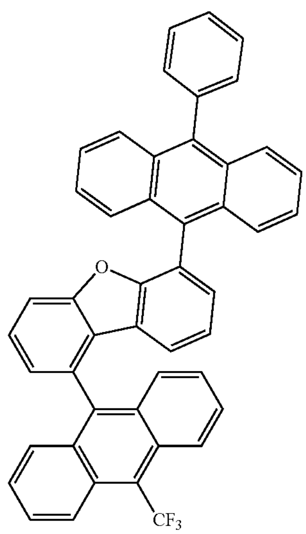
796
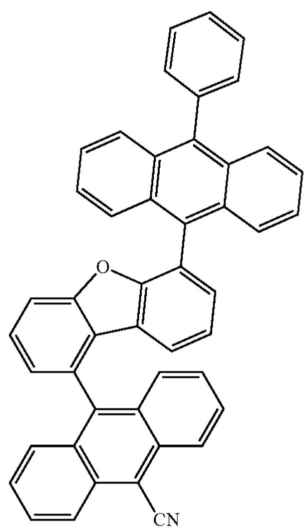
797
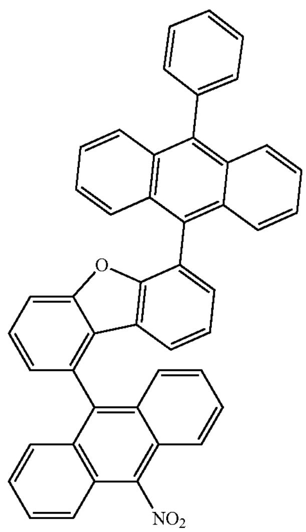
798
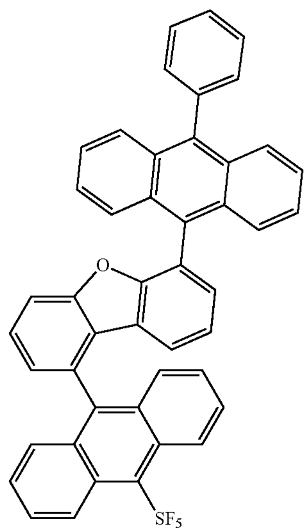
799
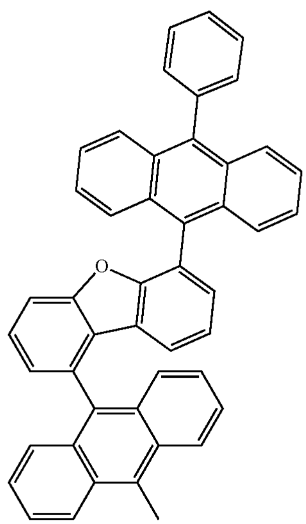
800
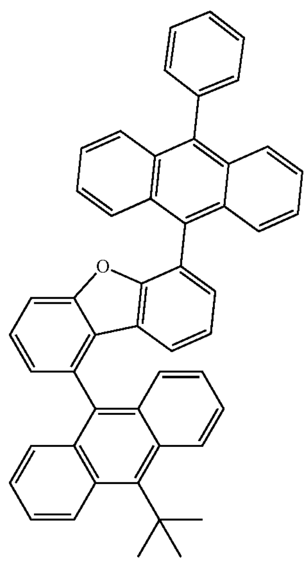

801
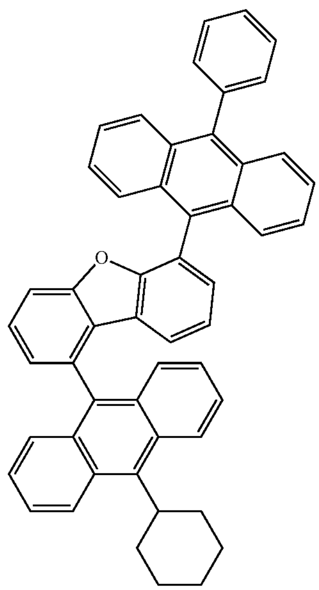
802
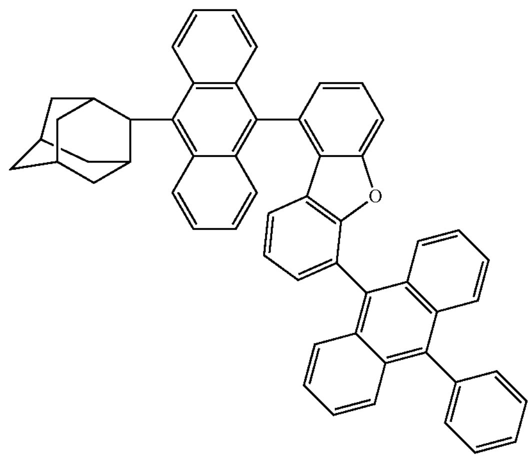
803
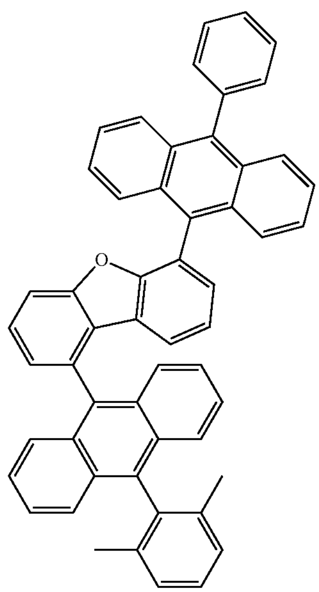
804
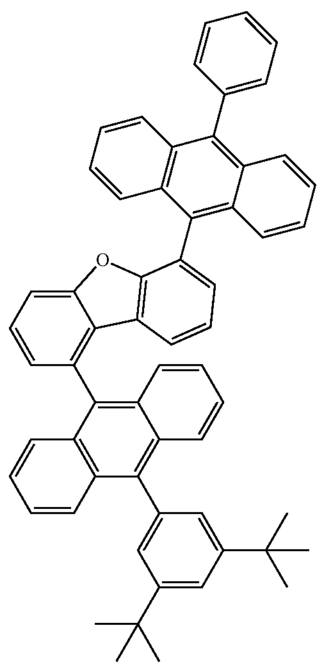

-continued
805
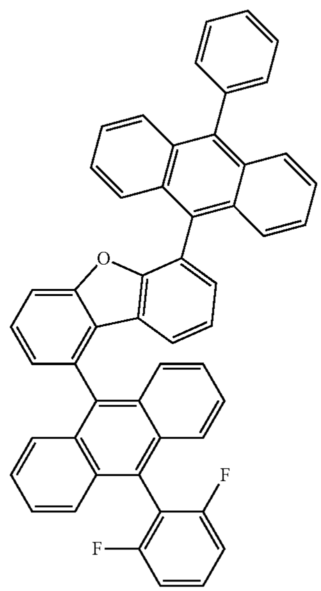
806
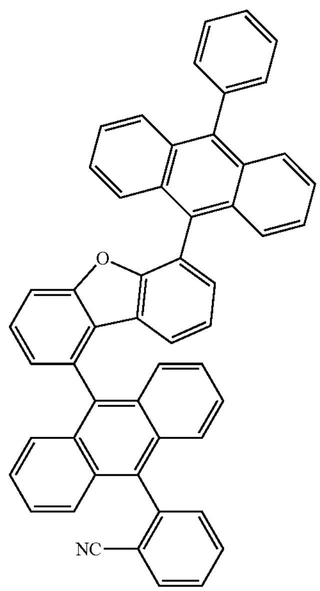
807
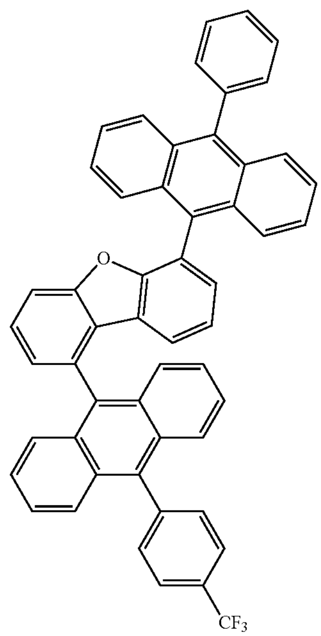
808
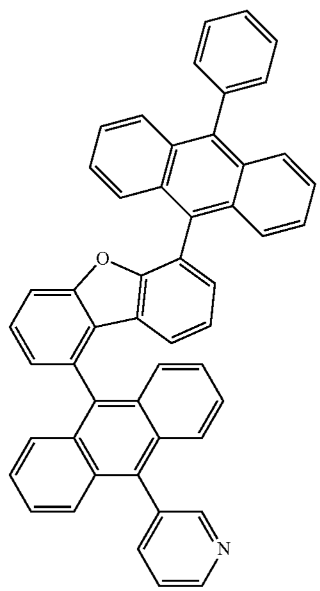

-continued
809
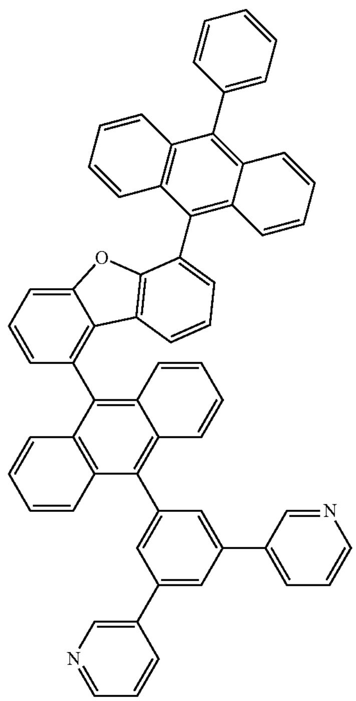
810
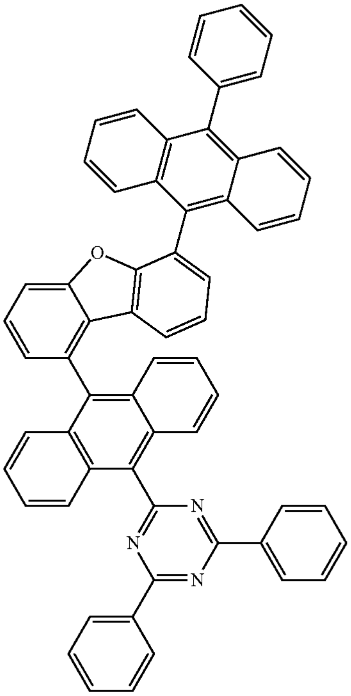
811
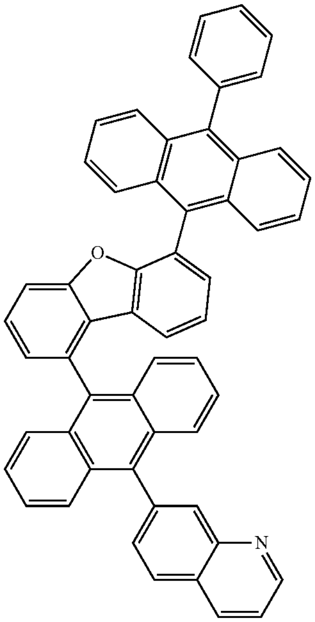
812
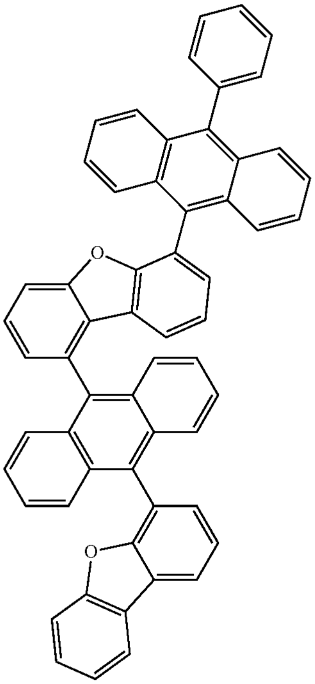

-continued
813
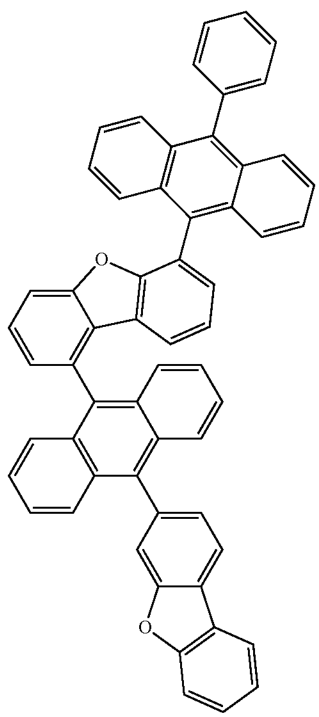
814
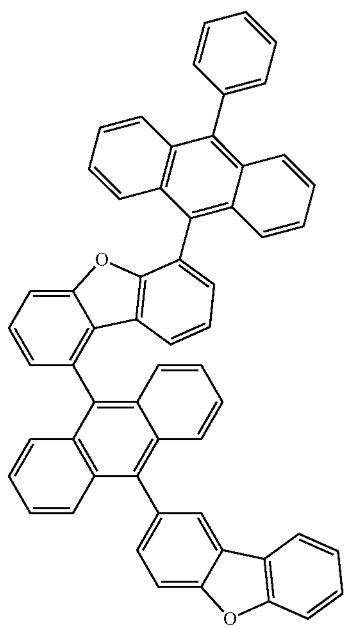
815
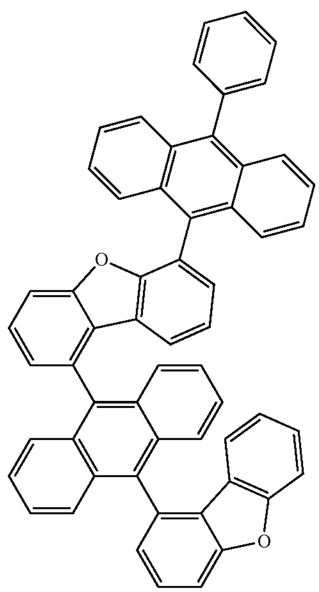
816
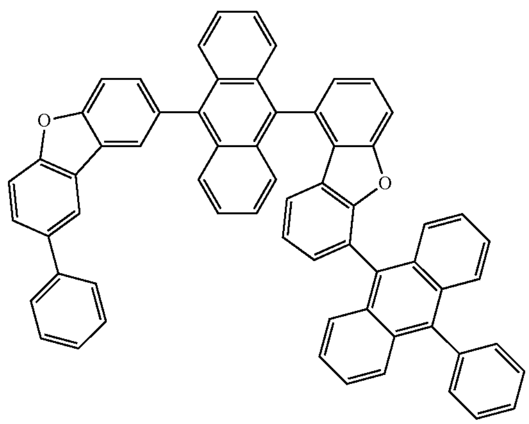

-continued
817
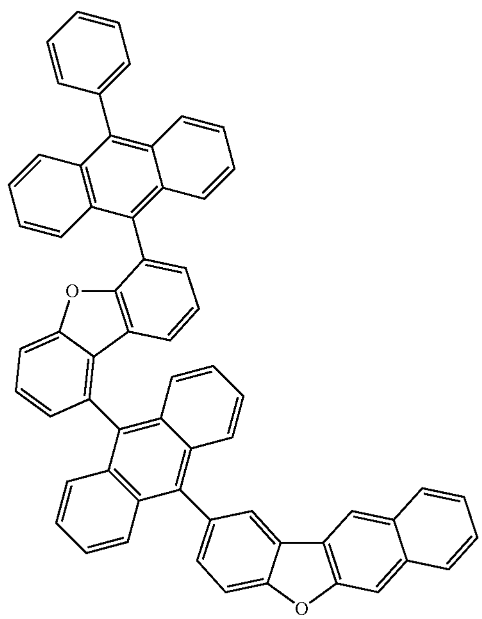
818
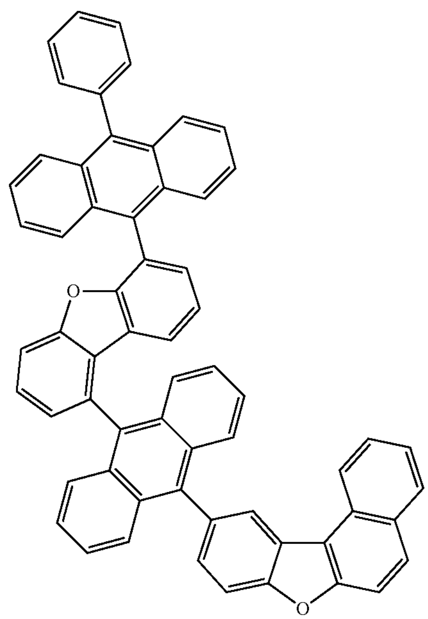
819
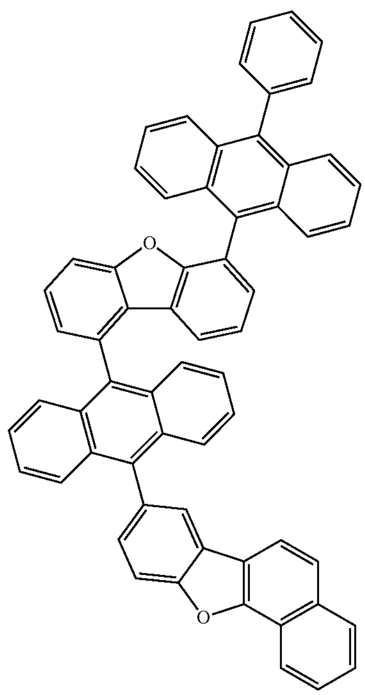
820
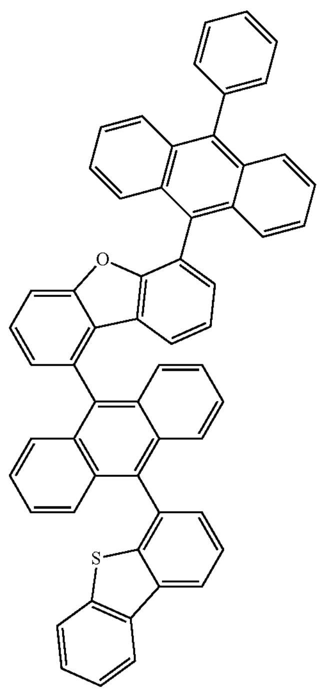

-continued
821
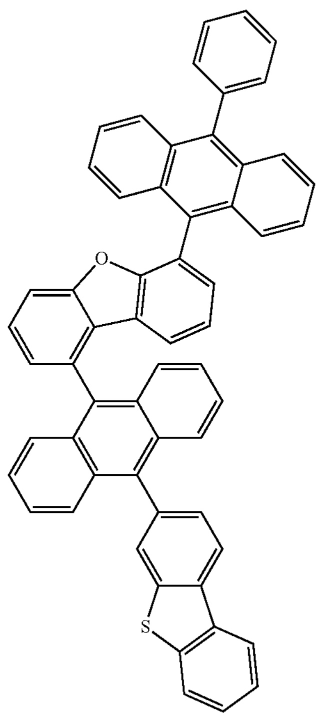
822
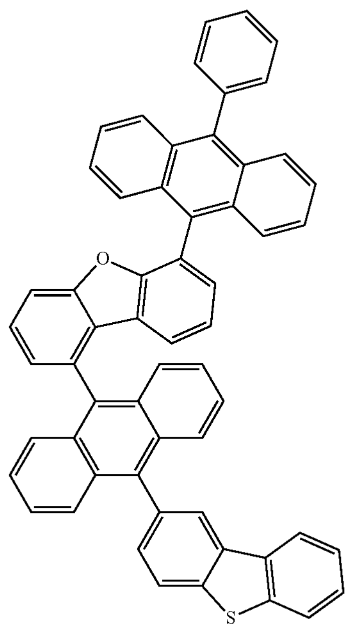
823
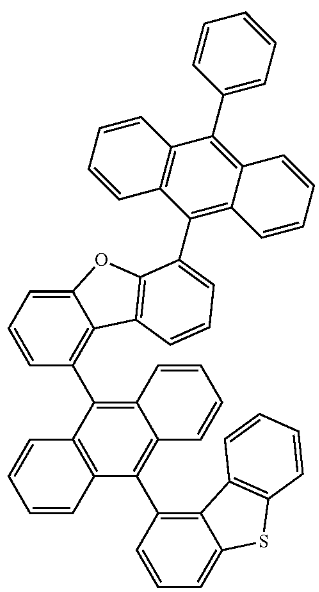
824
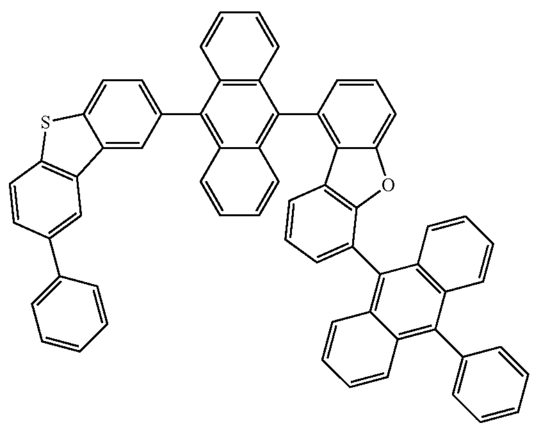

-continued
825
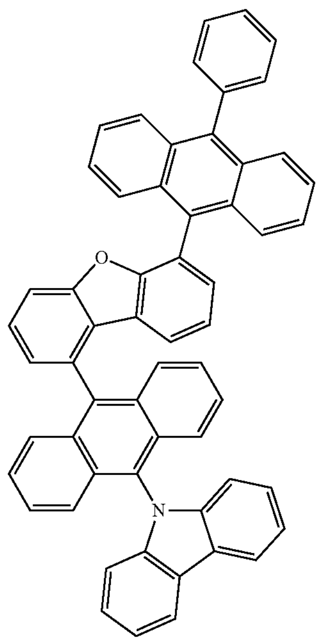
826
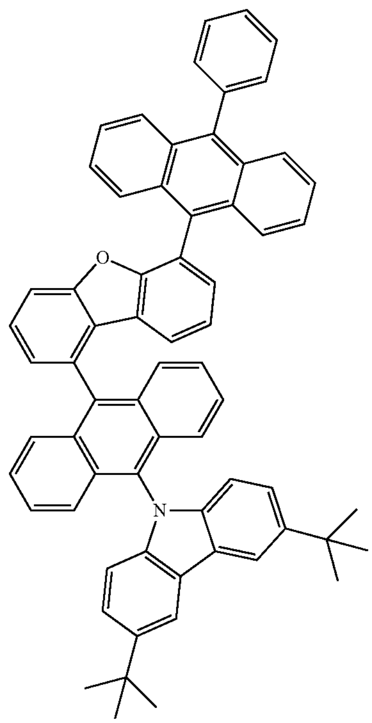
827
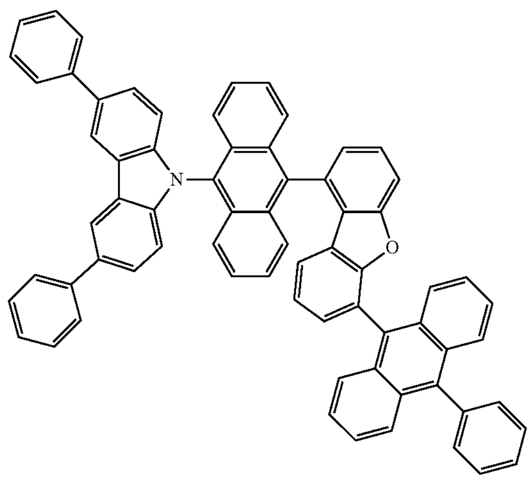
828
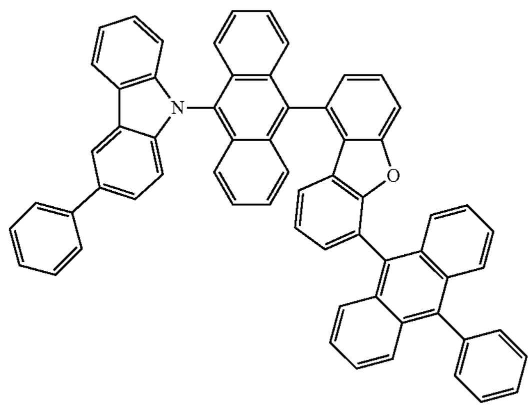

-continued
829
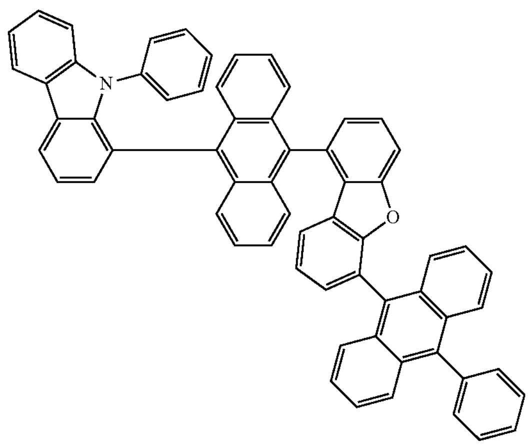
830
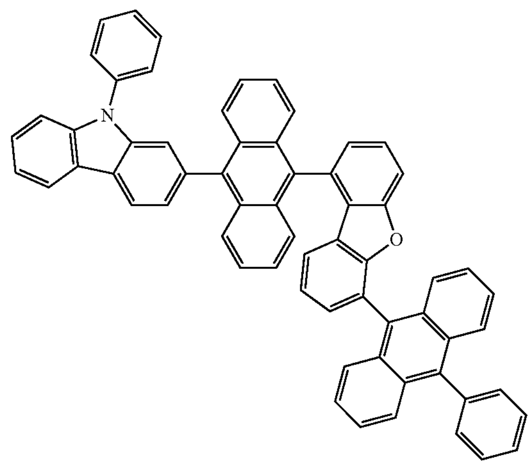
831
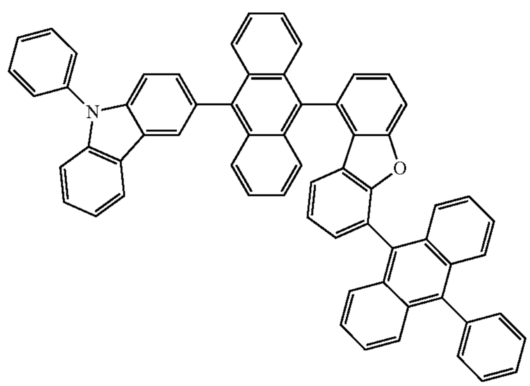
832
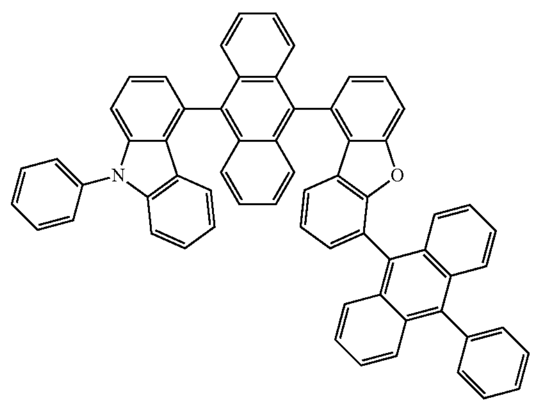
833
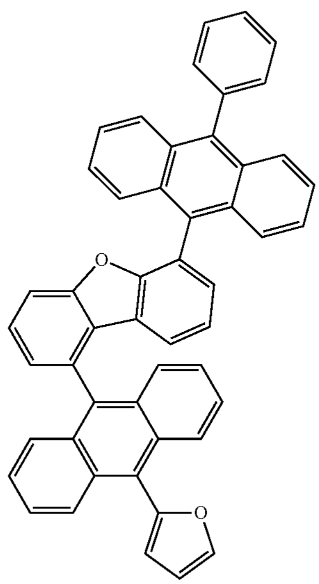
834
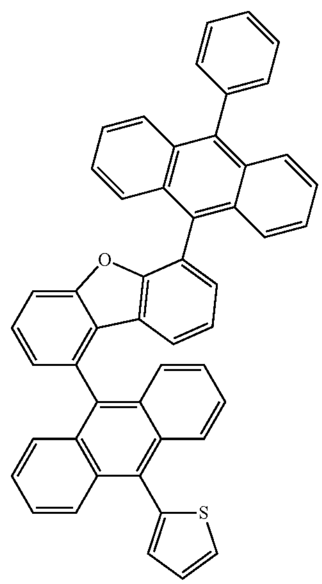

-continued
835
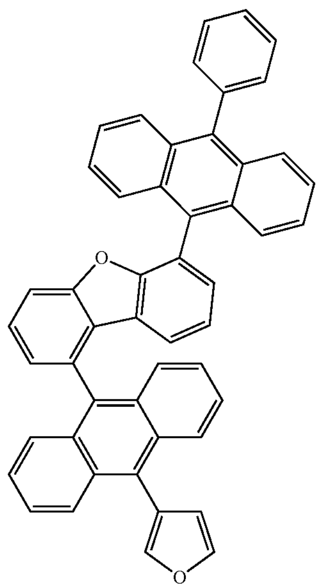
836
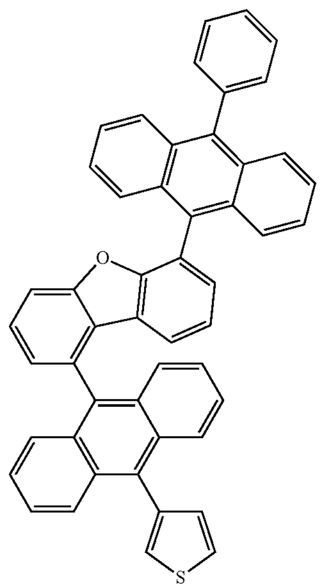
837
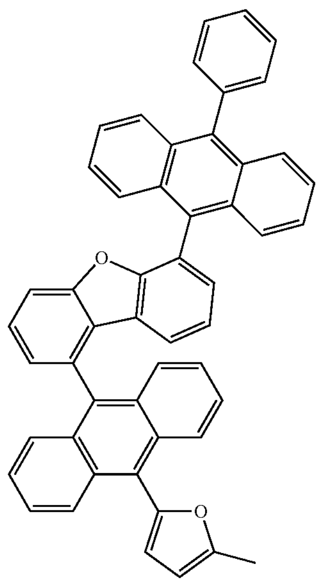
838
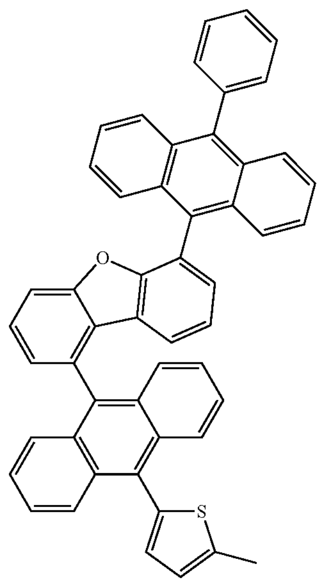

-continued
839
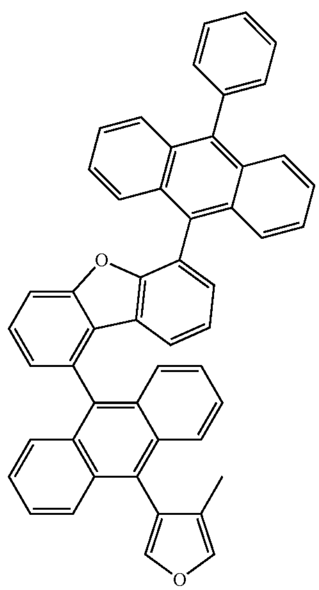
840
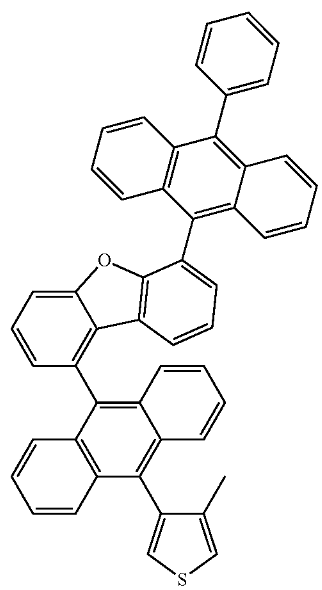
841
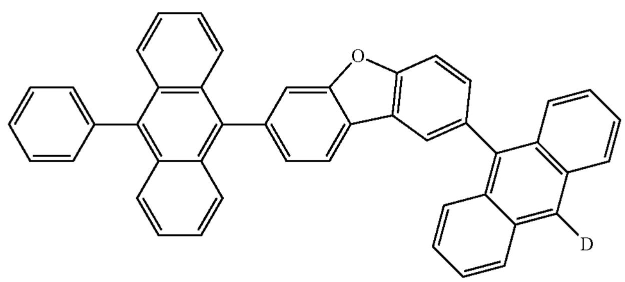
842
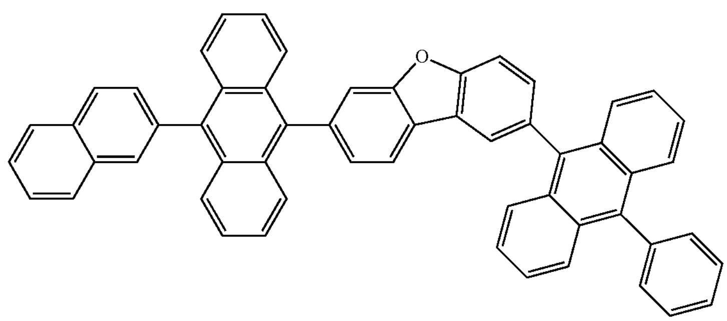
843
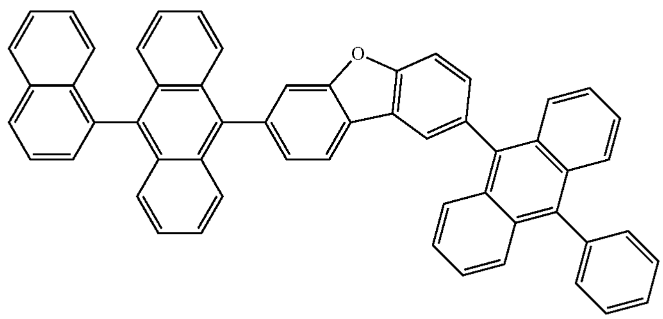

-continued
844
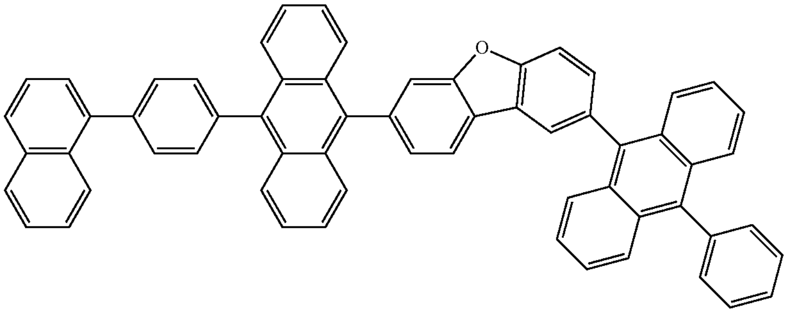
845
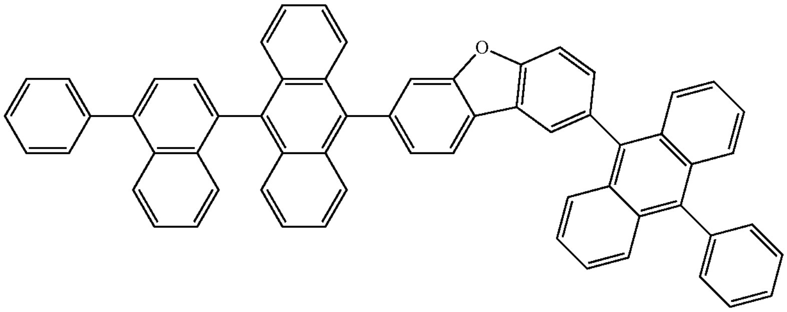
846
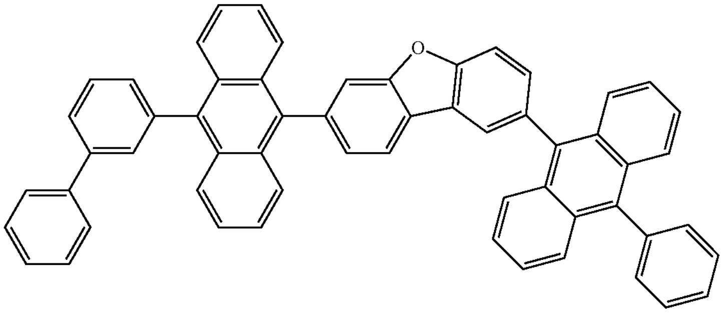
847
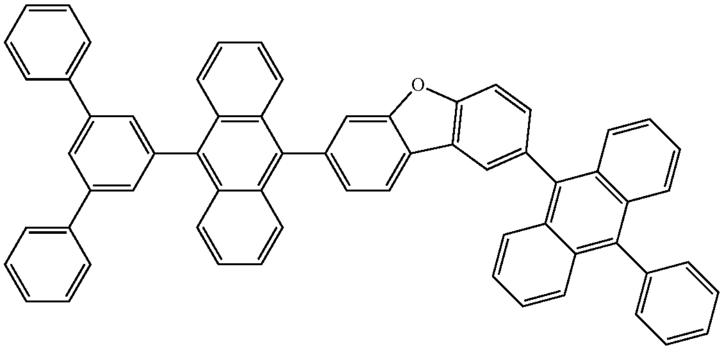
848
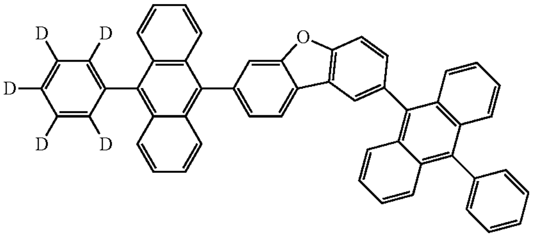
849
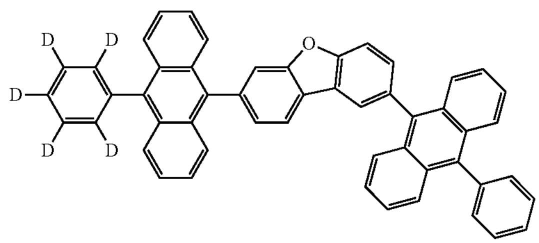

-continued
850
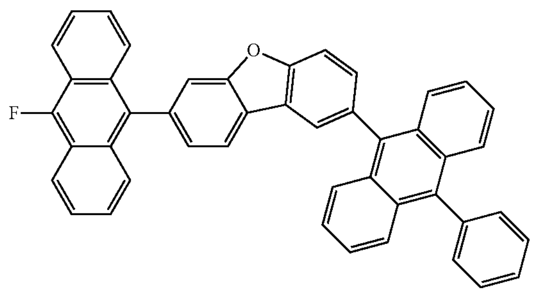
851
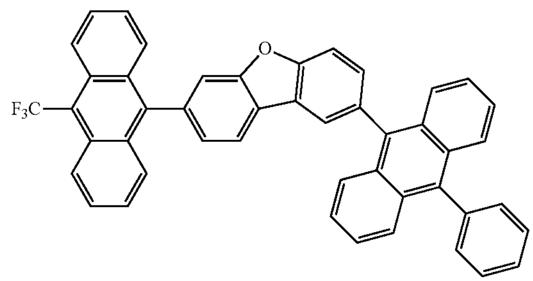
852
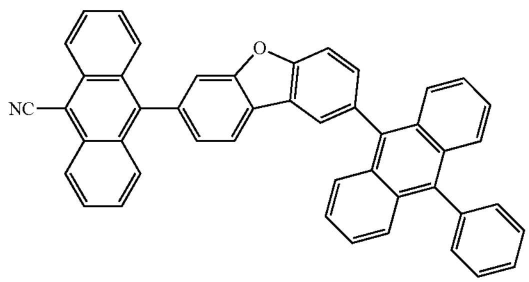
853
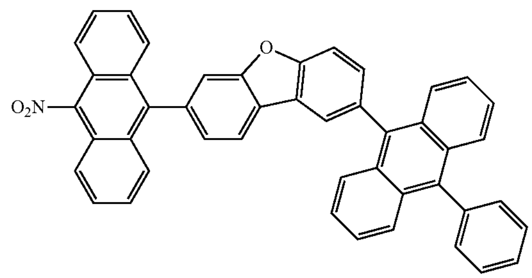
854
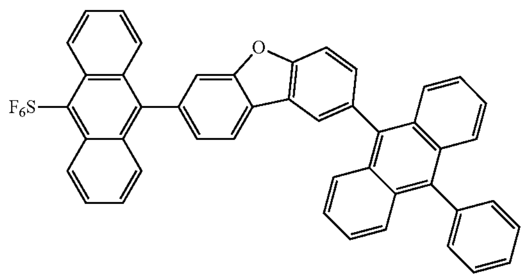
855
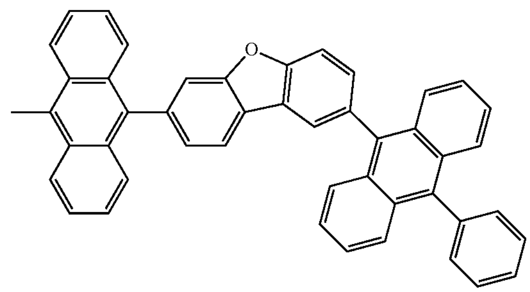
856
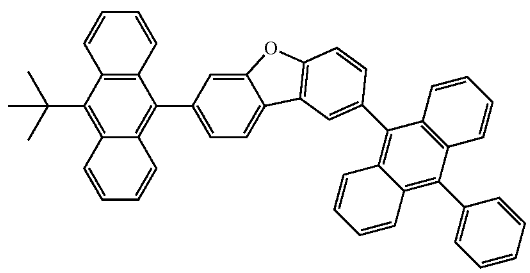
857
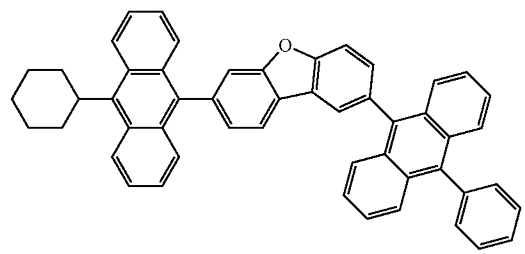
858
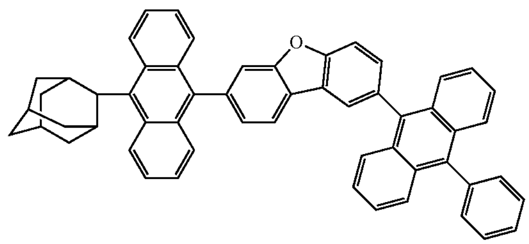
859
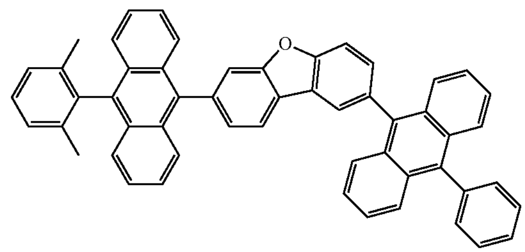

-continued
860
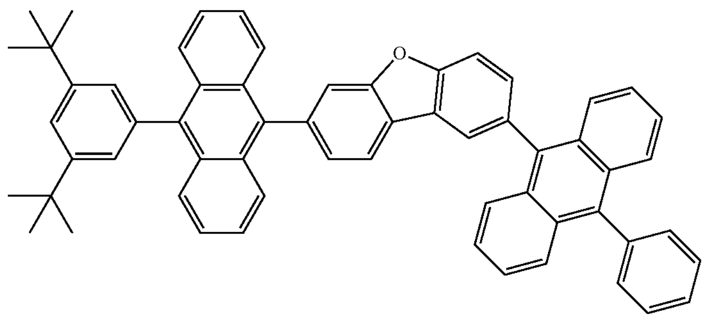
861
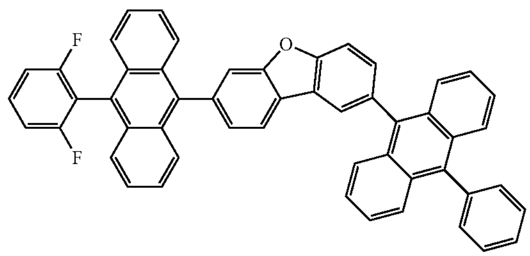
862
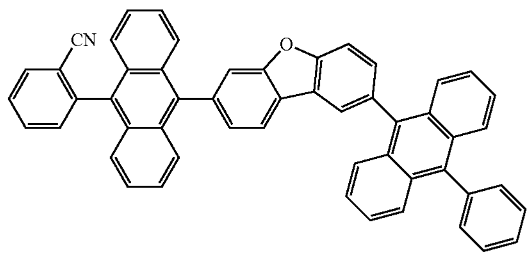
863
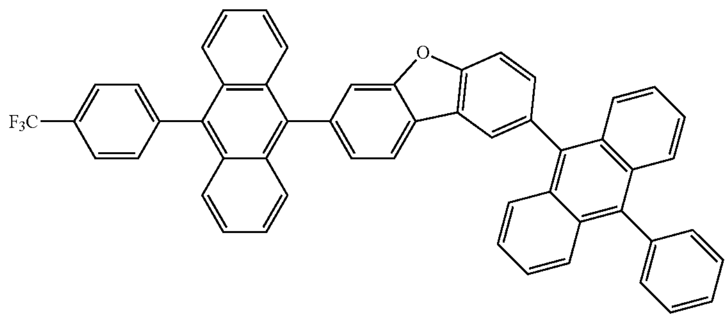
864
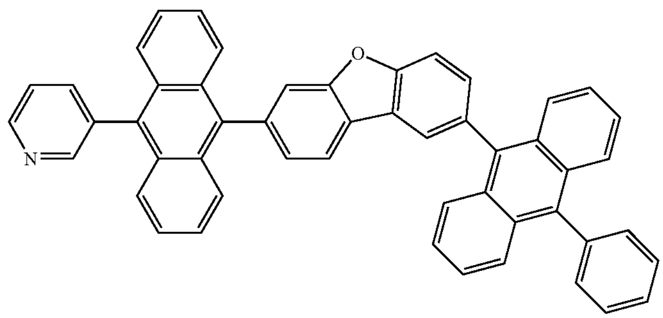
865
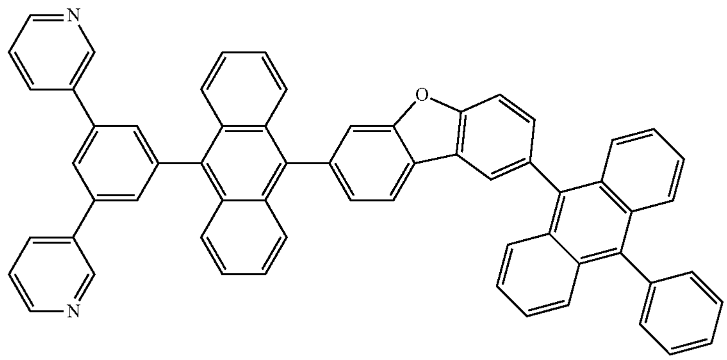

-continued
866
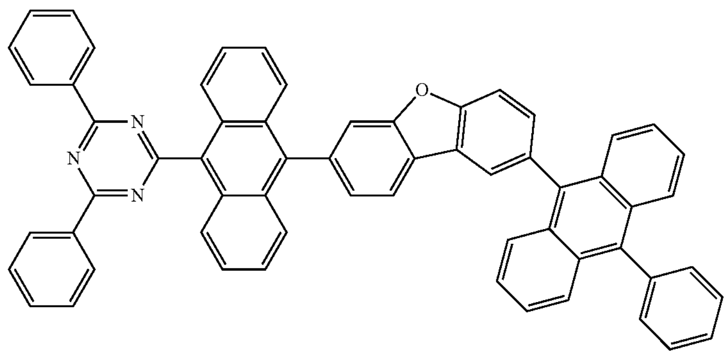
867
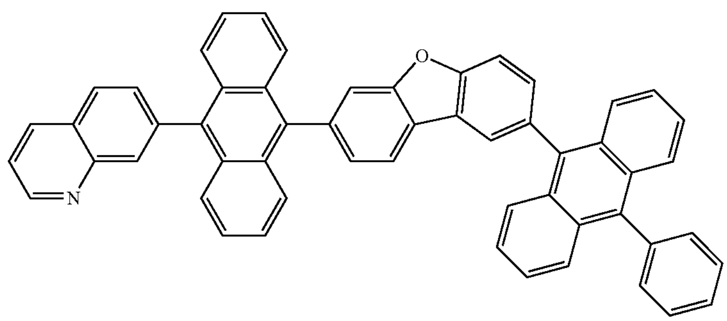
868
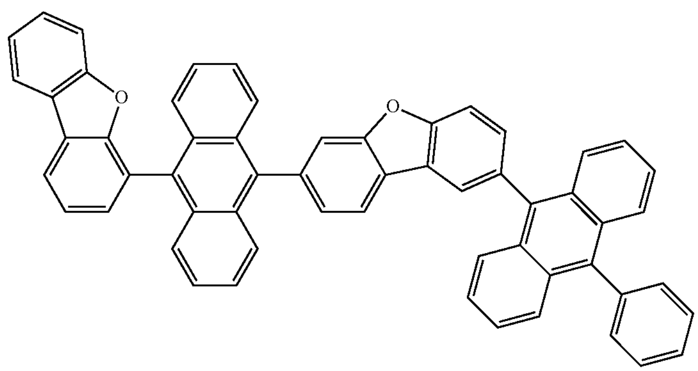
869
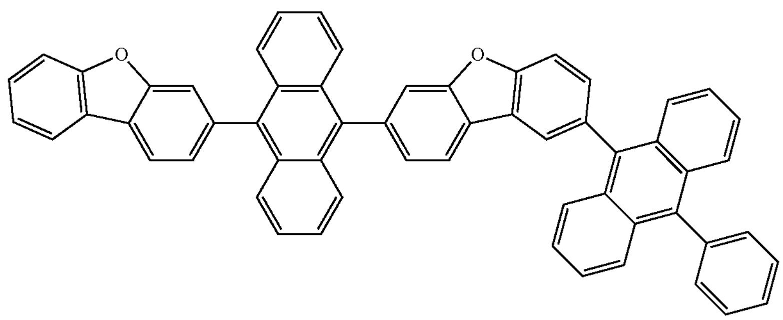

-continued
870
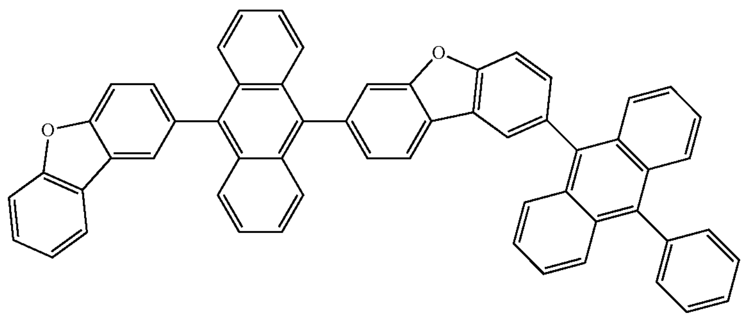
871
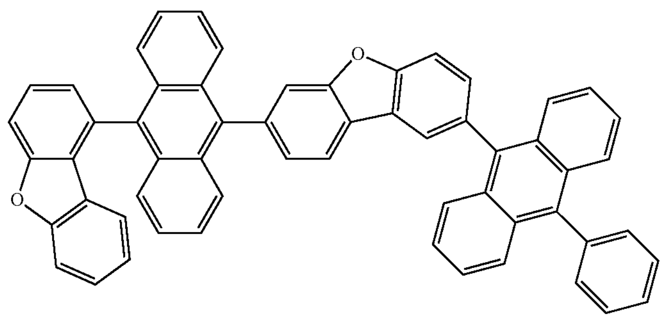
872
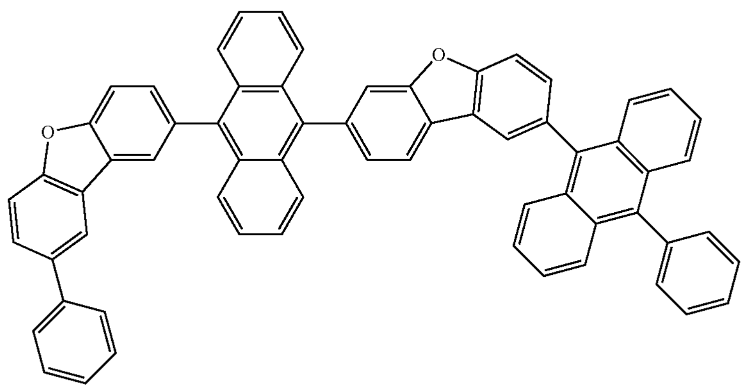
873
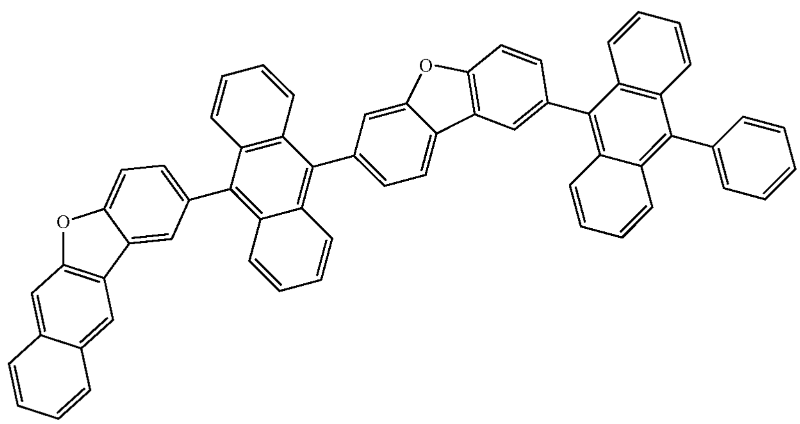

-continued
874
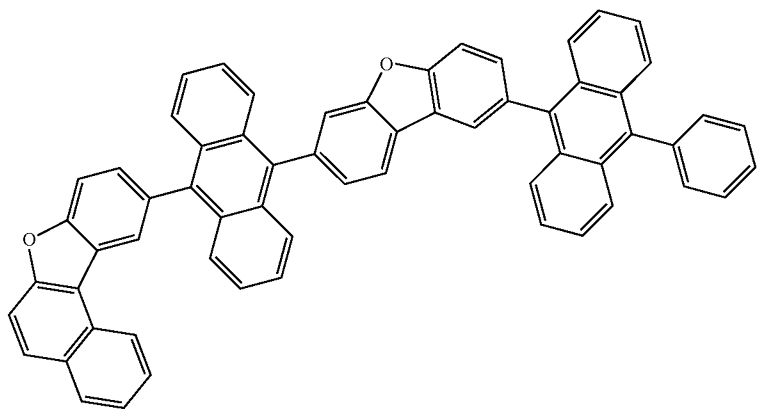
875
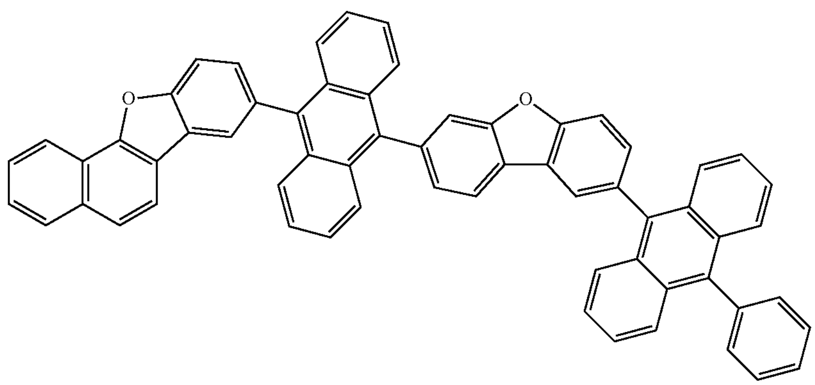
876
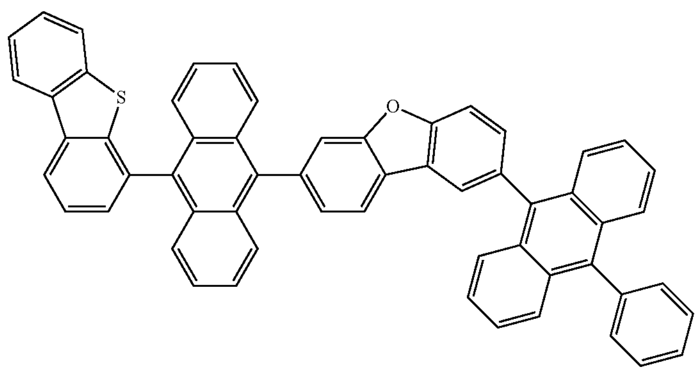
877
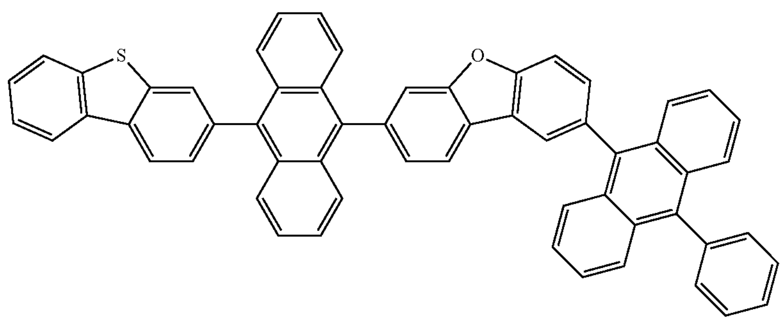

-continued
878
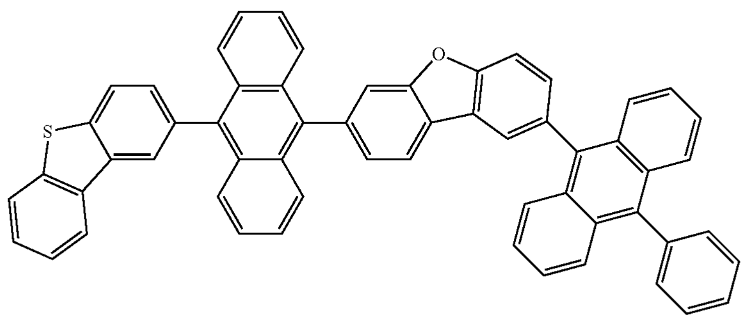
879
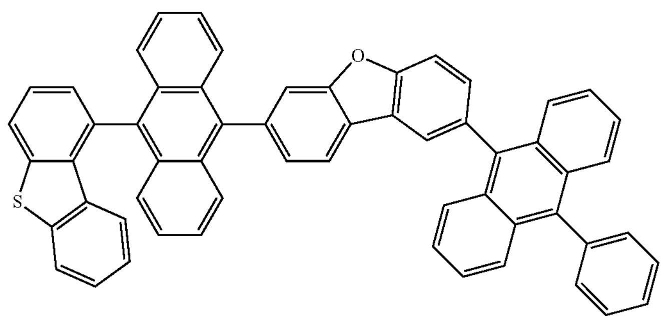
880
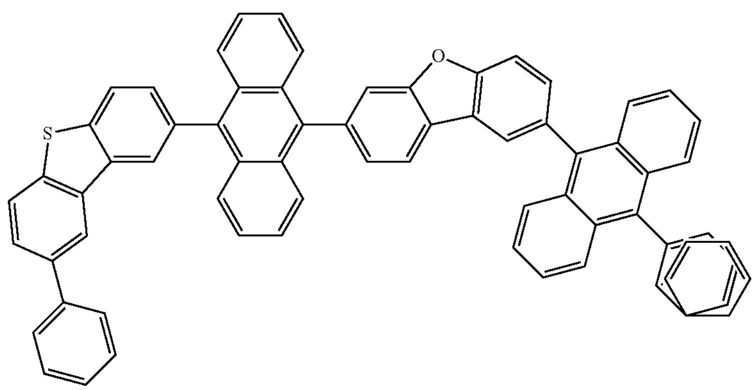
881
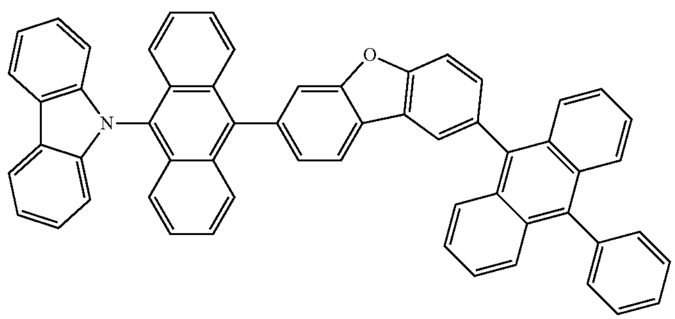

-continued
882
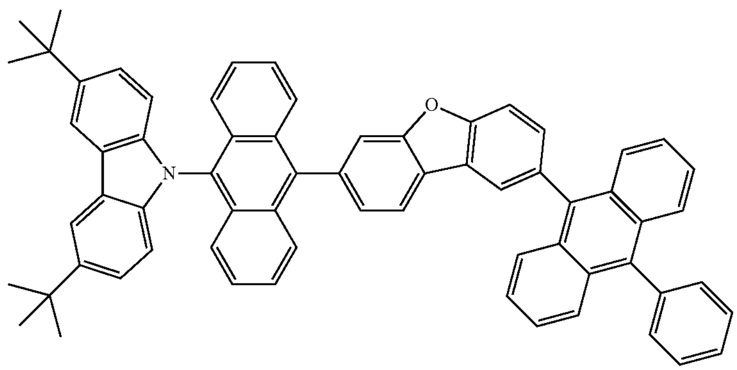
883
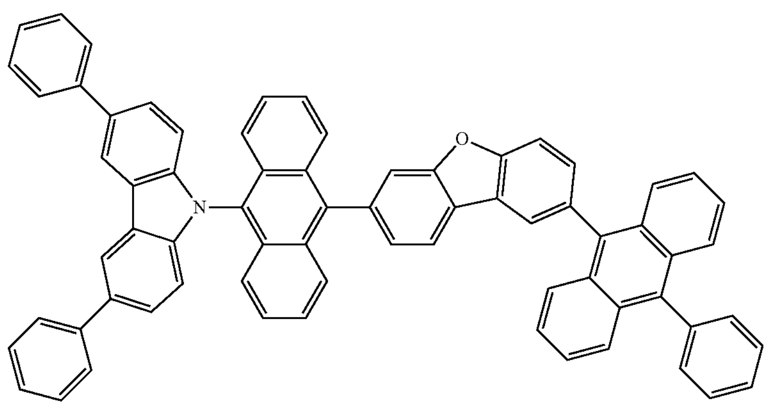
884
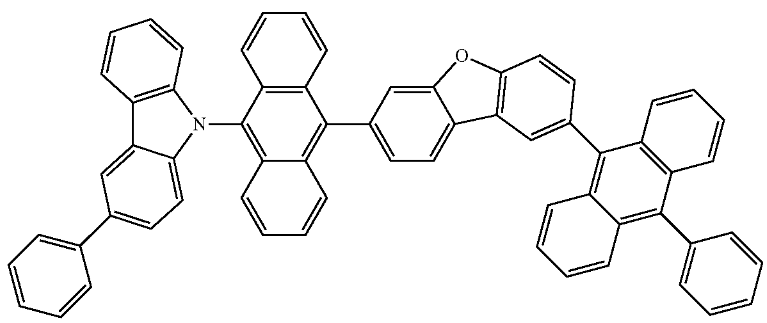
885
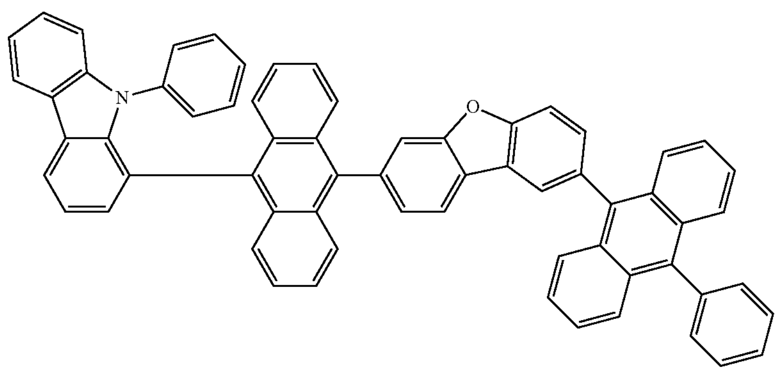

-continued
886
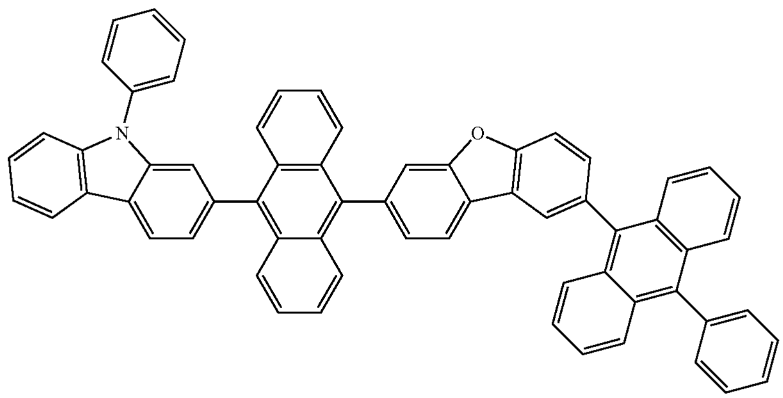
887
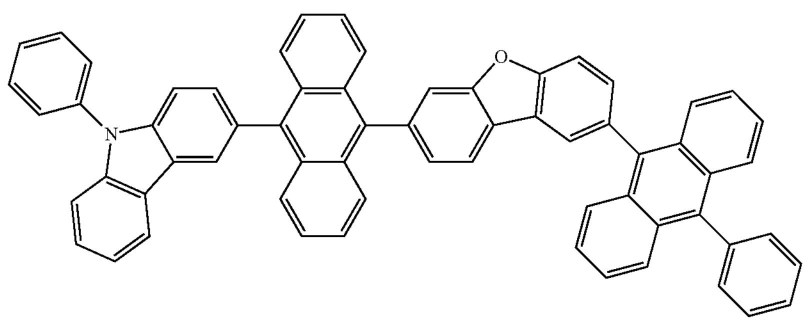
888
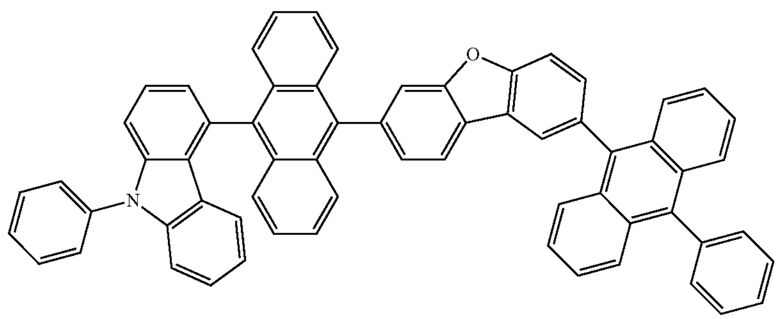
889
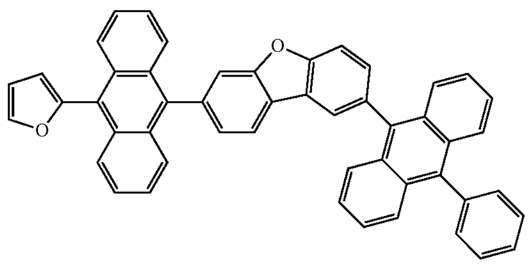
890
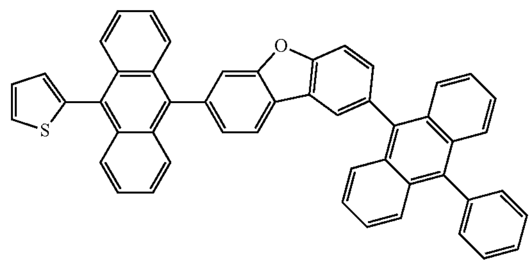
891
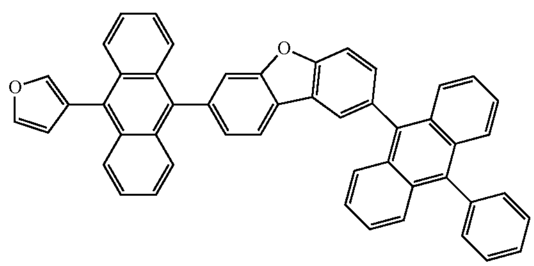
892
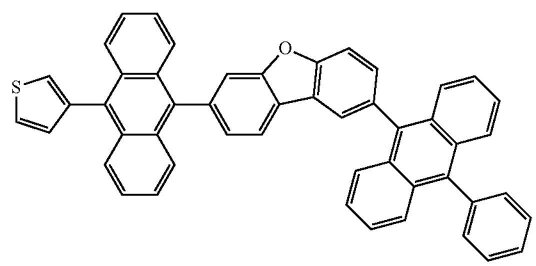

-continued
893
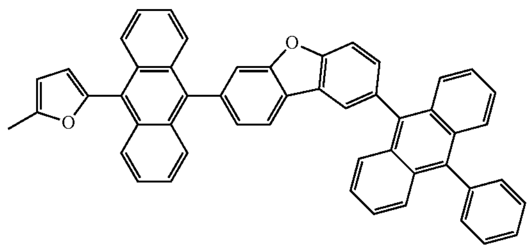
894
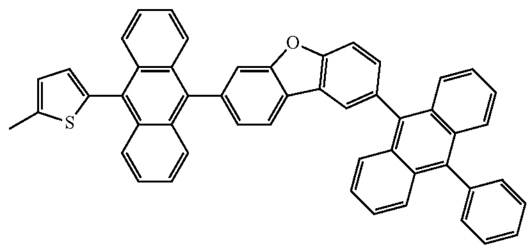
895
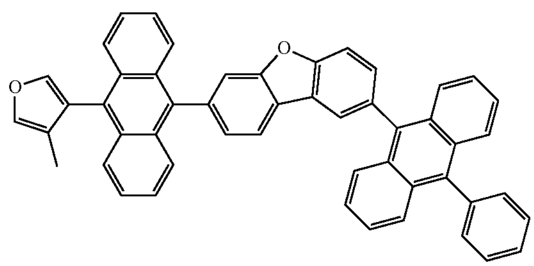
896
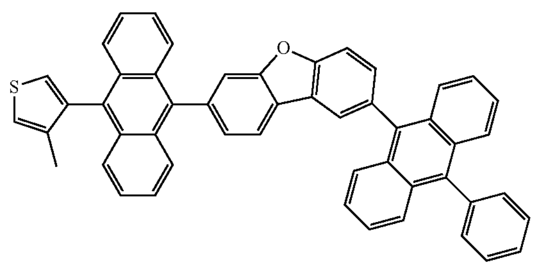
897
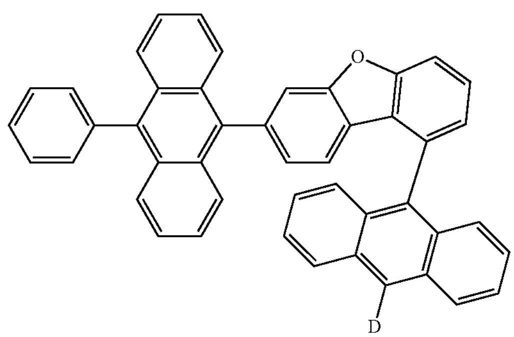
898
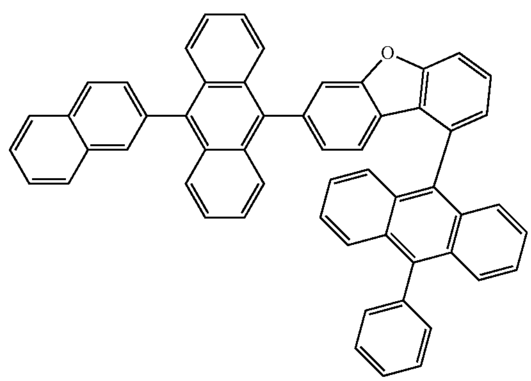
899
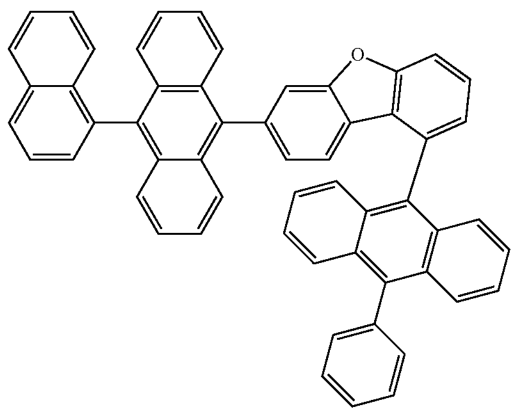
900
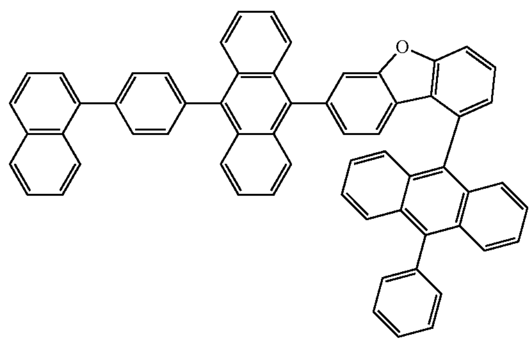

-continued
901
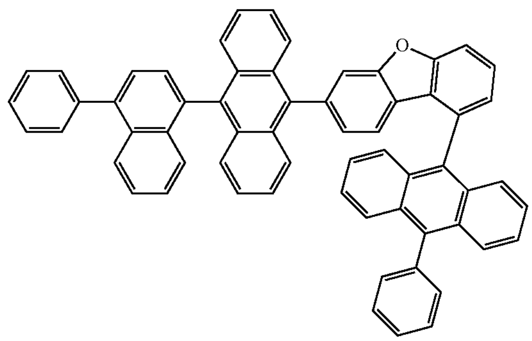
902
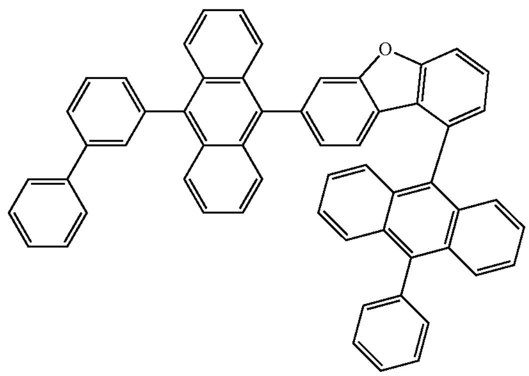
903
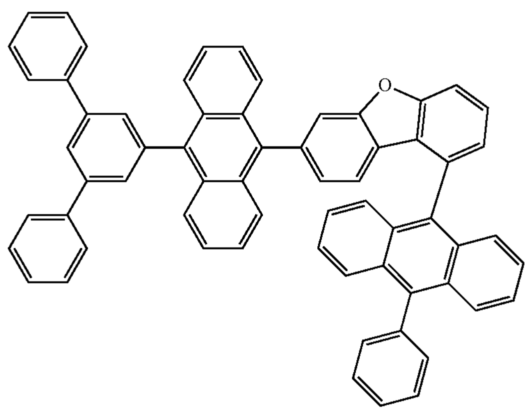
904
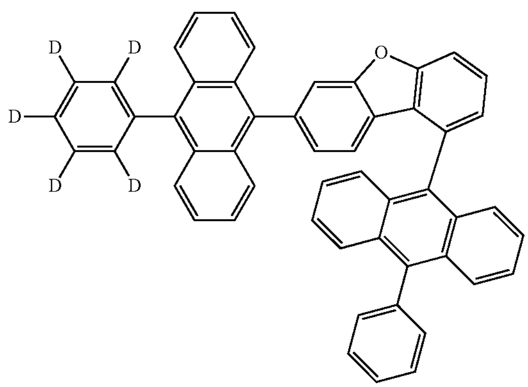
905
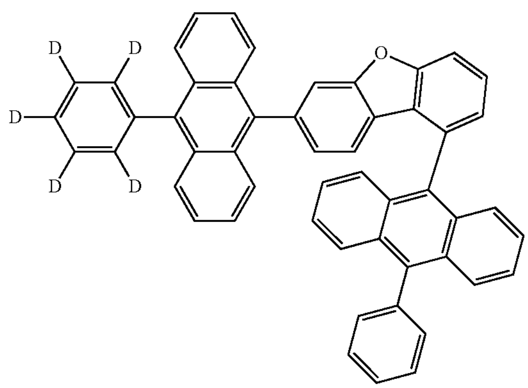
906
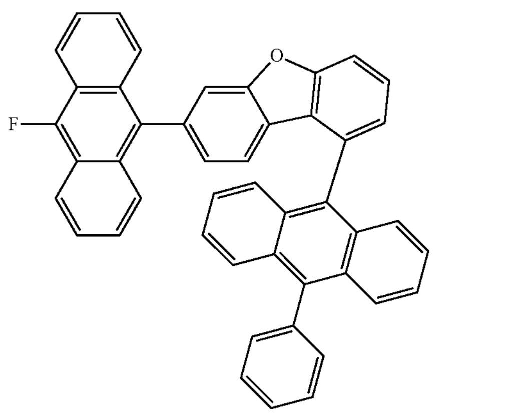
907
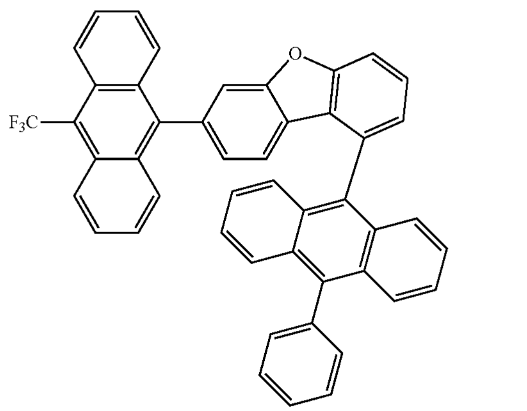
908
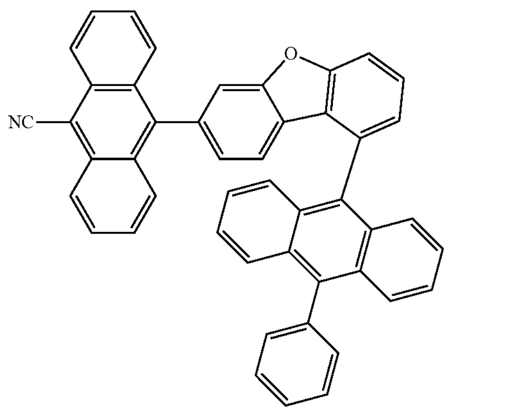

-continued
909
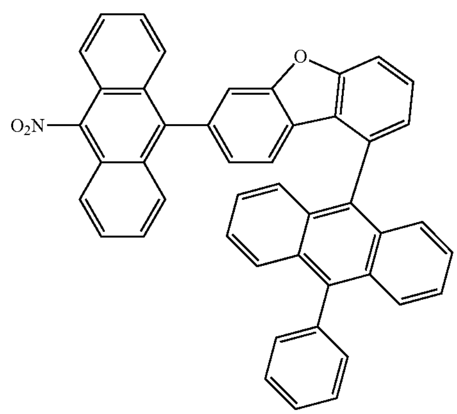
910
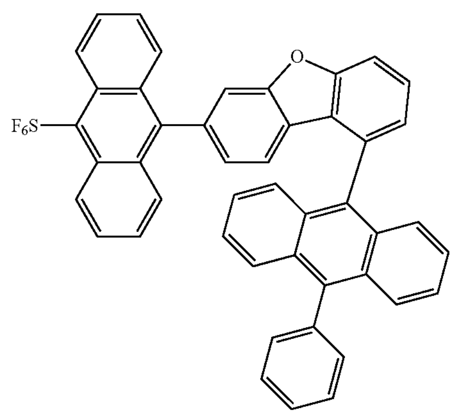
911
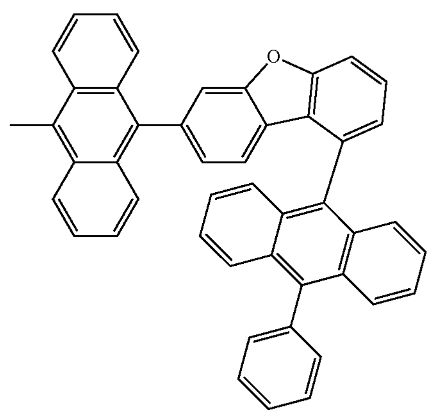
912
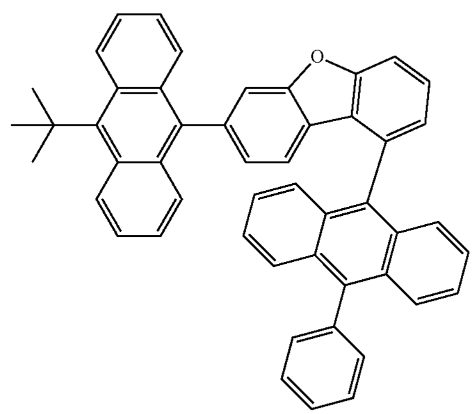
913
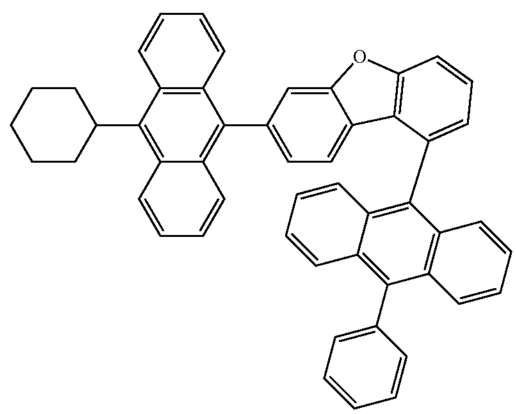
914
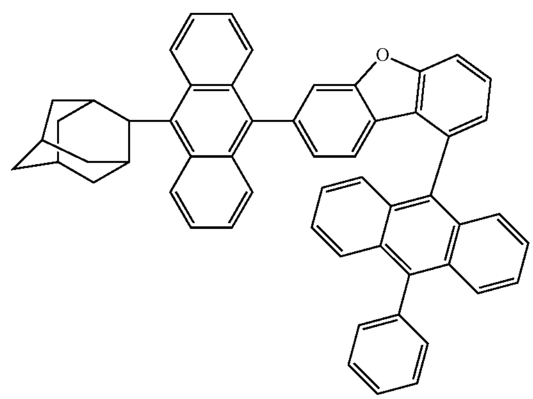

-continued
915
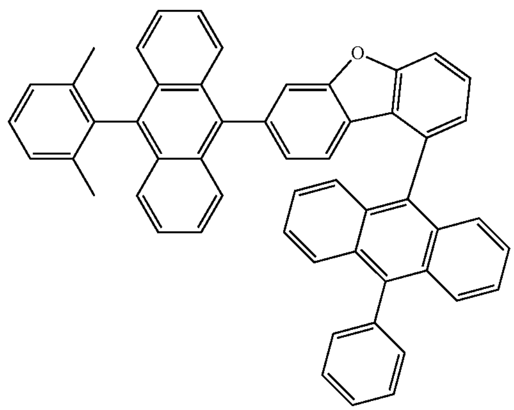
916
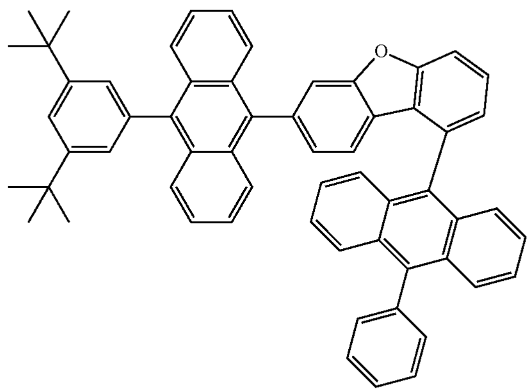
917
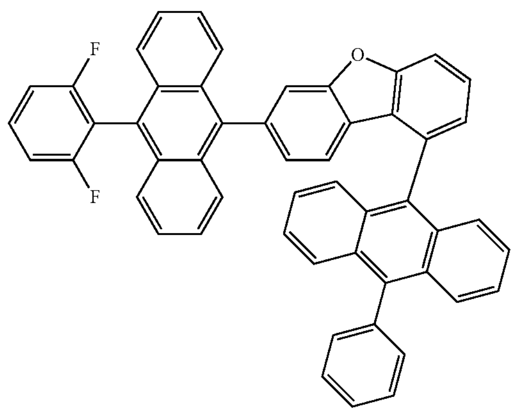
918
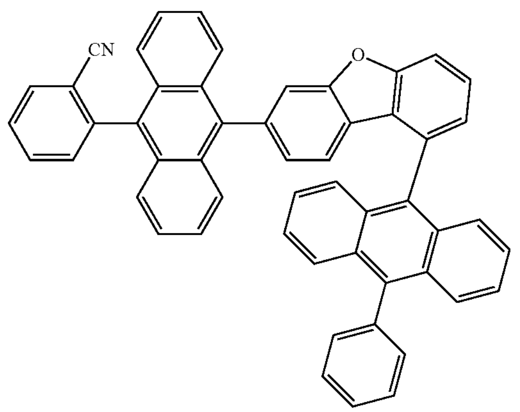
919
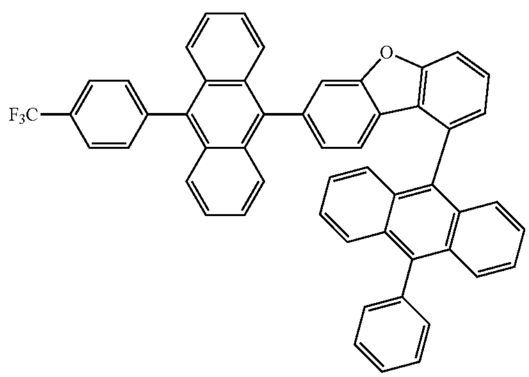
920
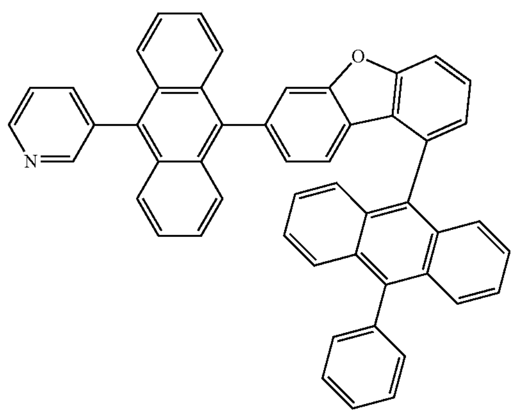
921
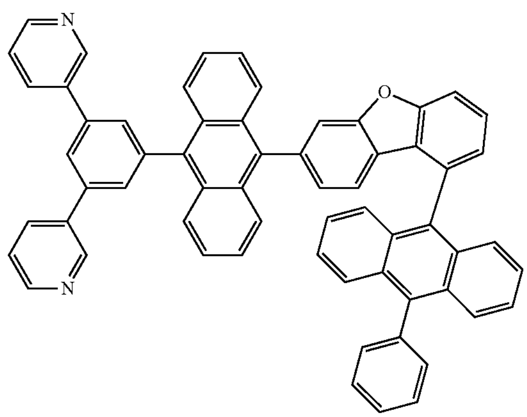
922
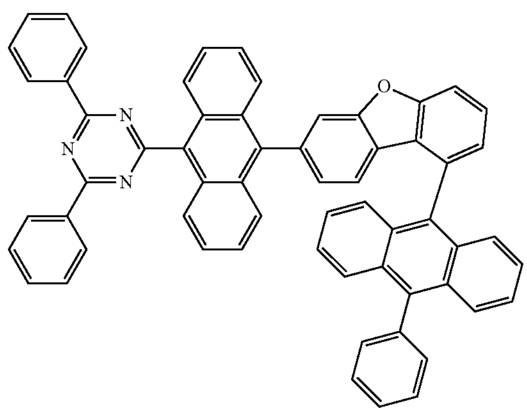

-continued
923
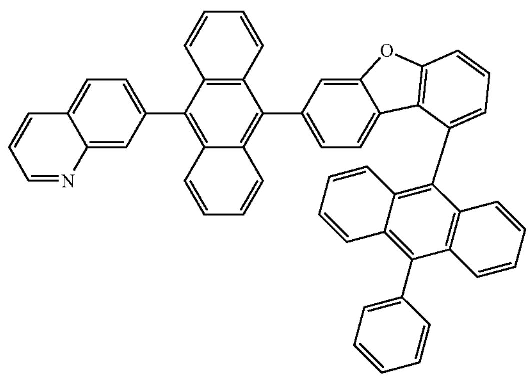
924
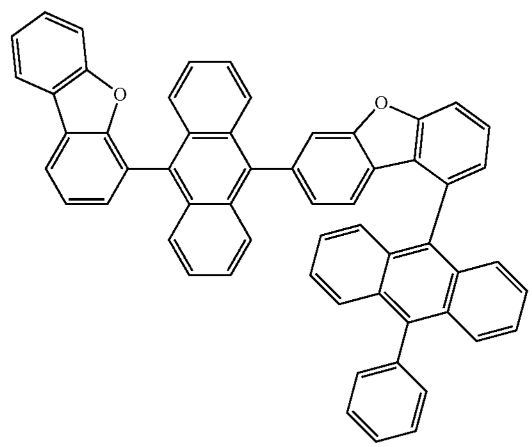
925
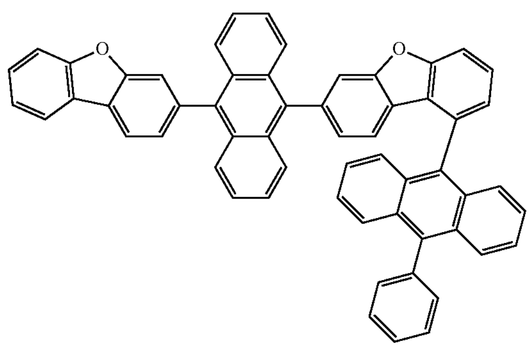
926
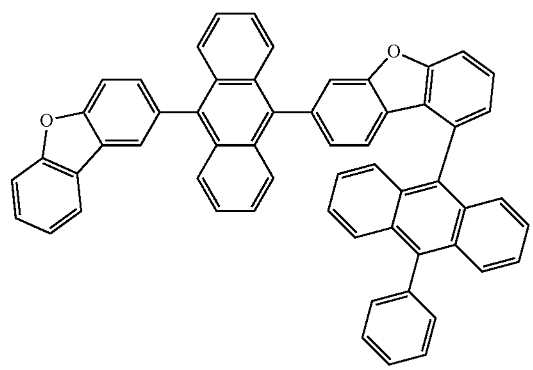
927
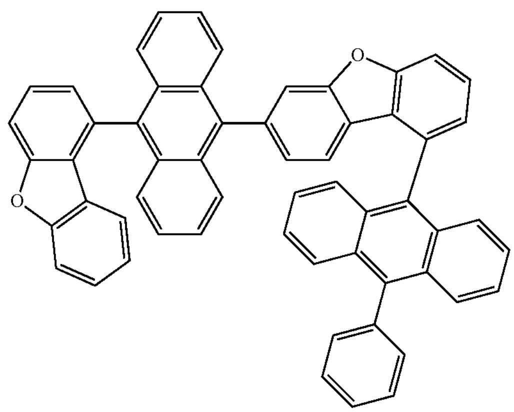
928
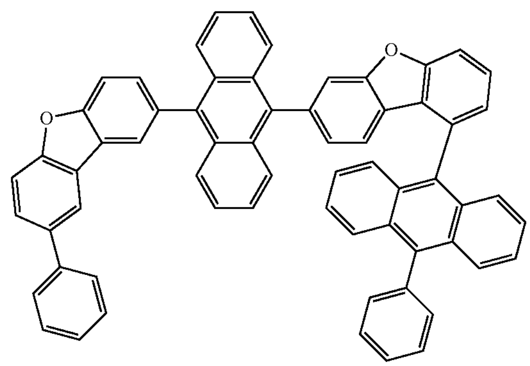
929
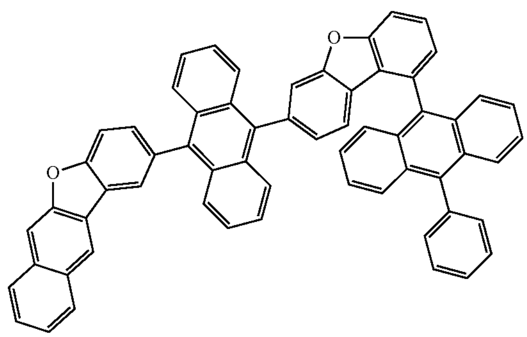
930
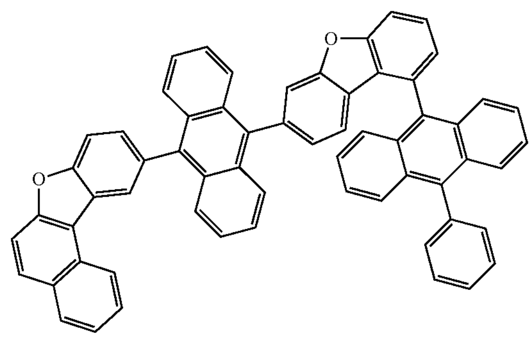

-continued
931
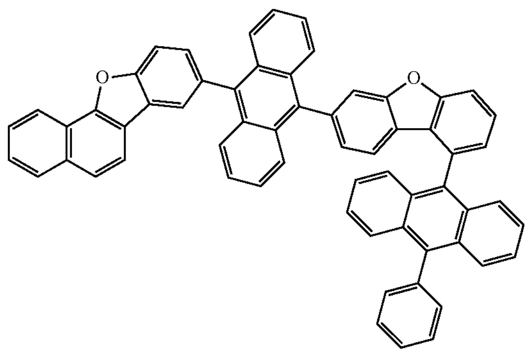
932
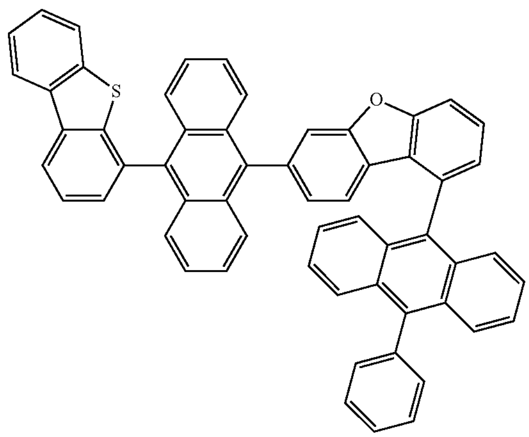
933
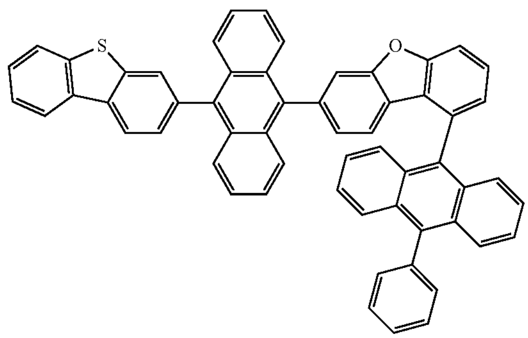
934
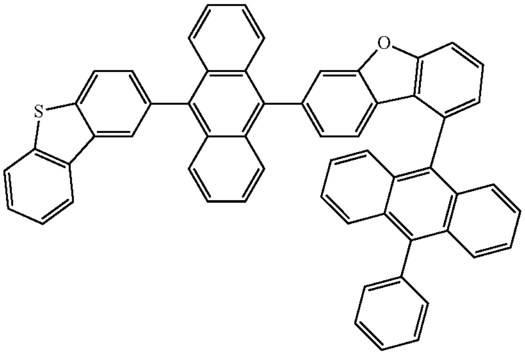
935
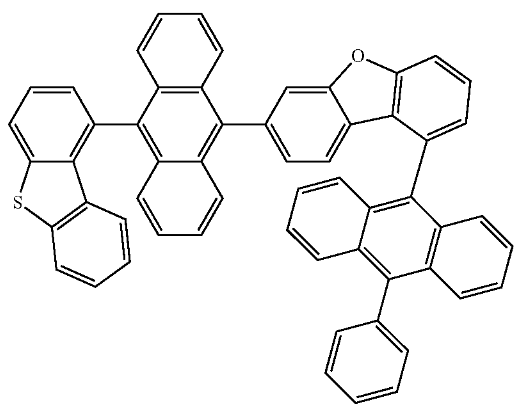
936
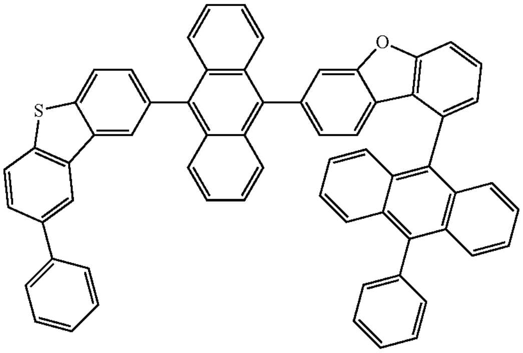
937
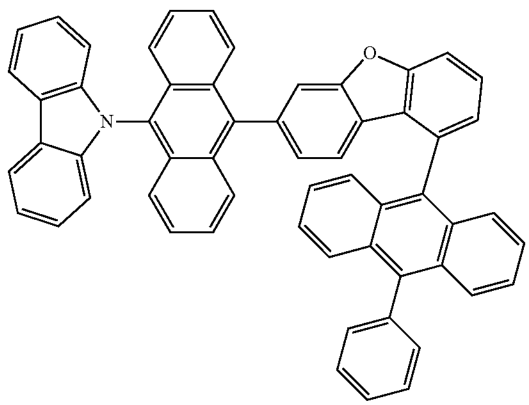
938
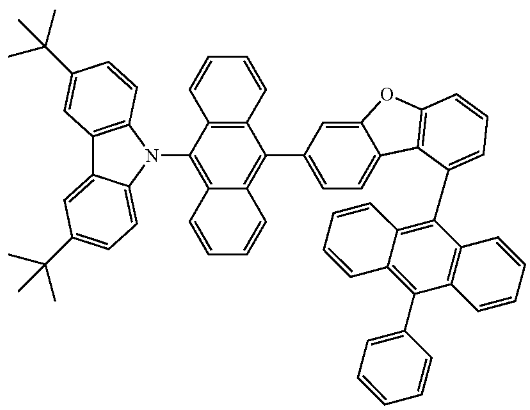

-continued
939
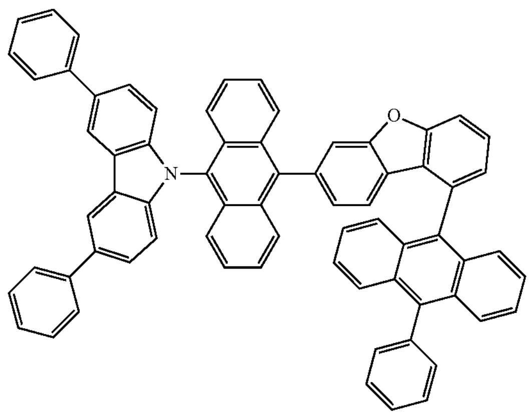
940
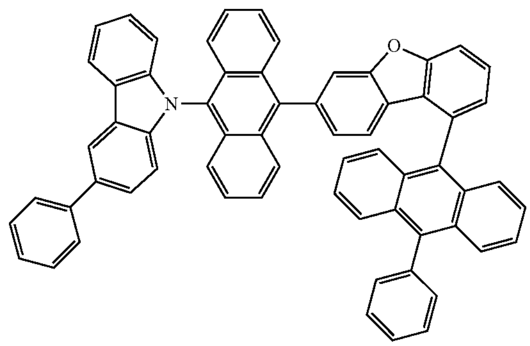
941
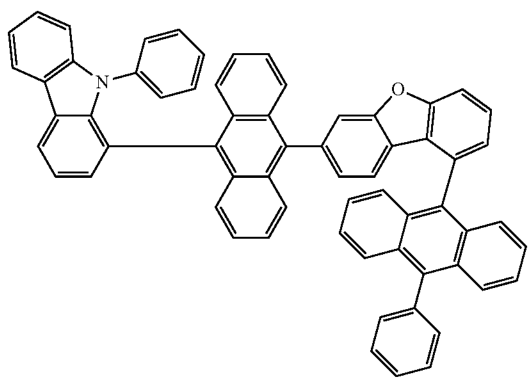
942
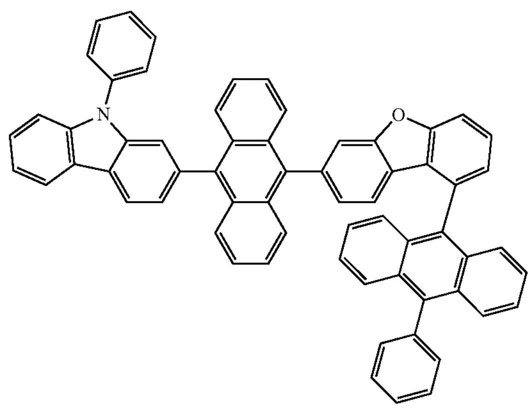
943
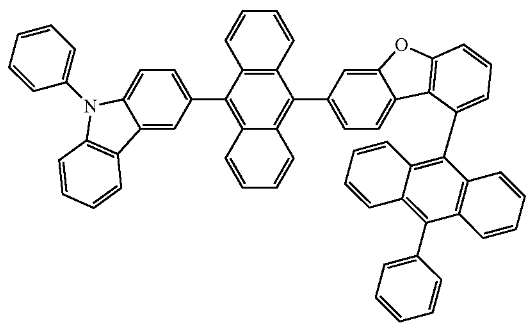
944
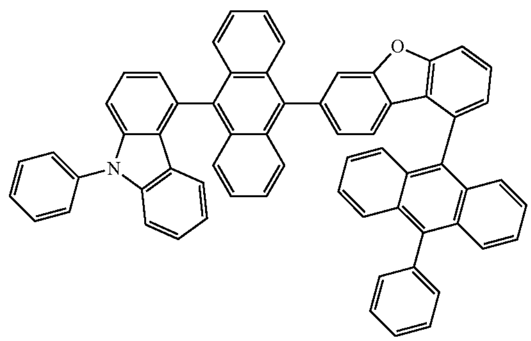
945
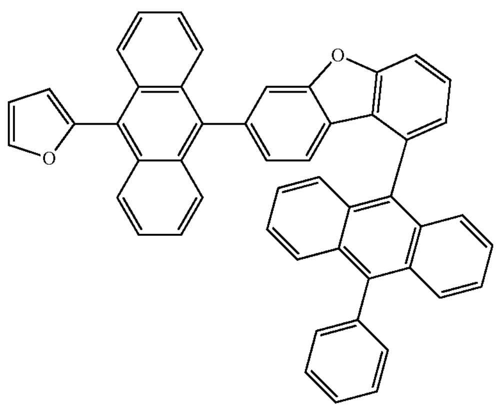
946
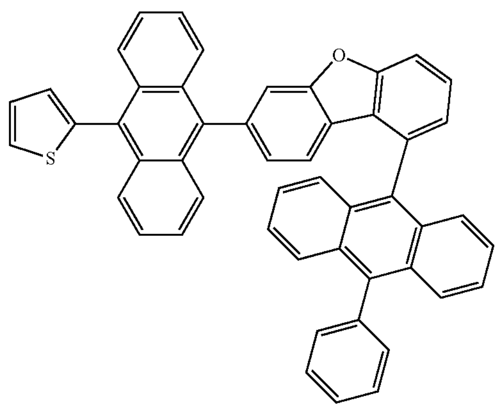

-continued
947
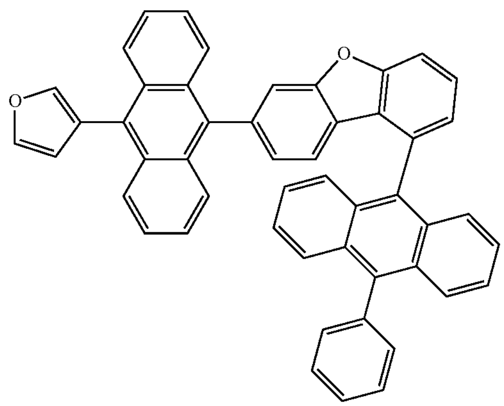
948
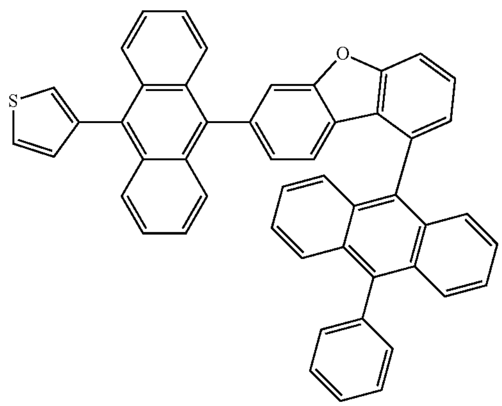
949
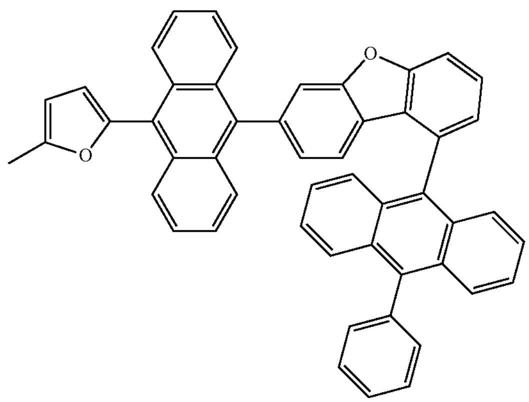
950
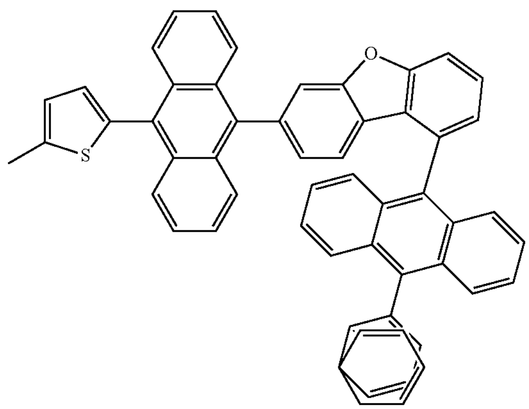
951
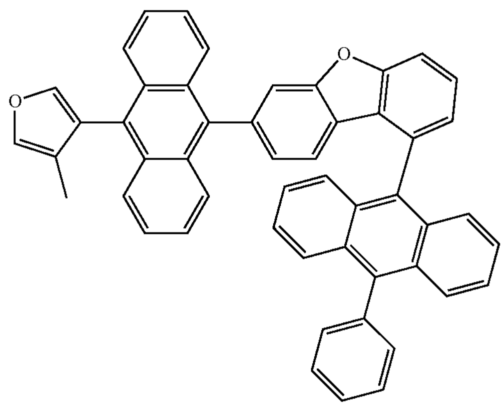
952
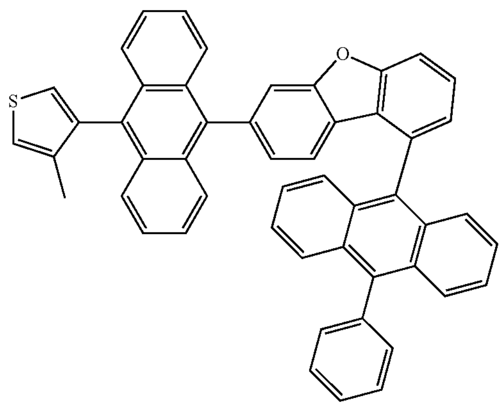

-continued
953
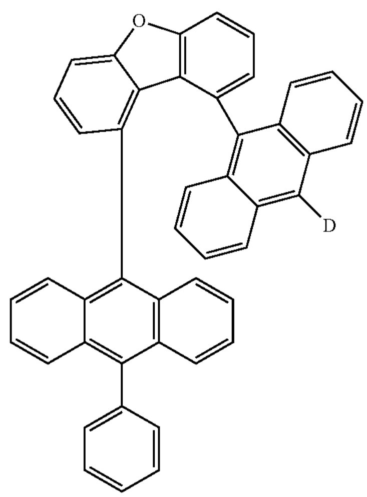
954
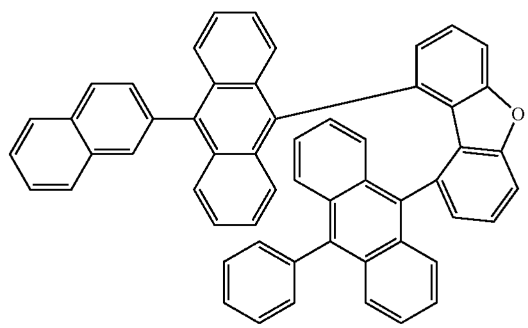
955
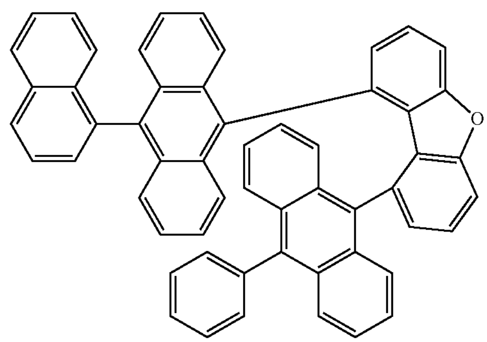
956
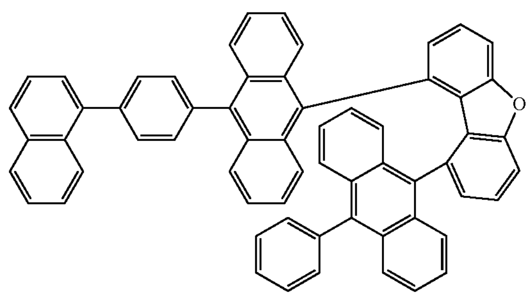
957
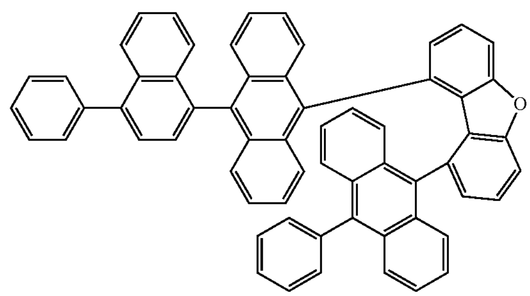
958
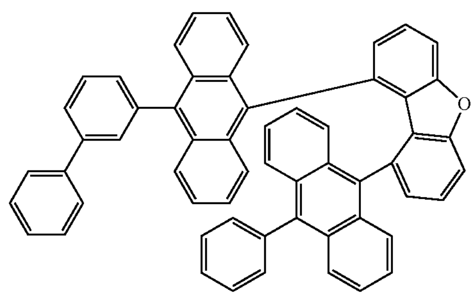
959
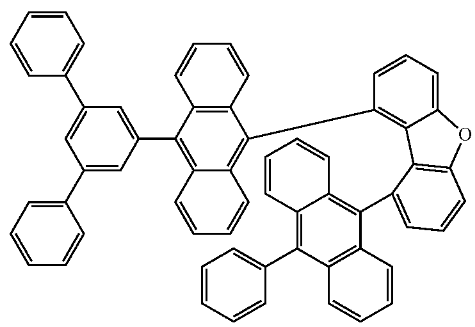
960
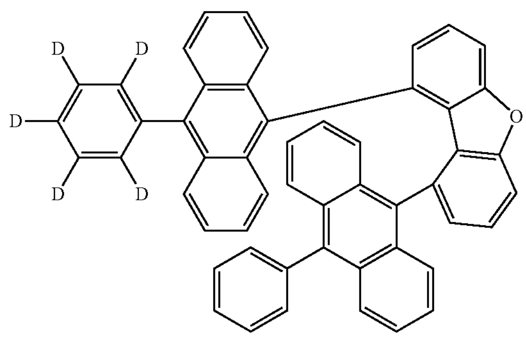

-continued
961
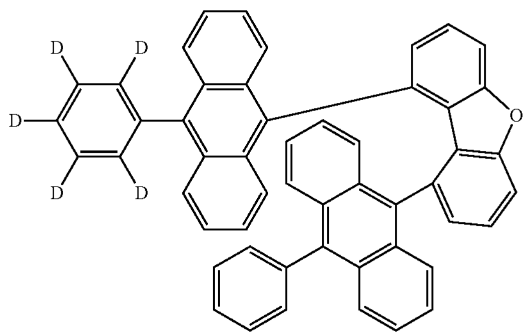
962
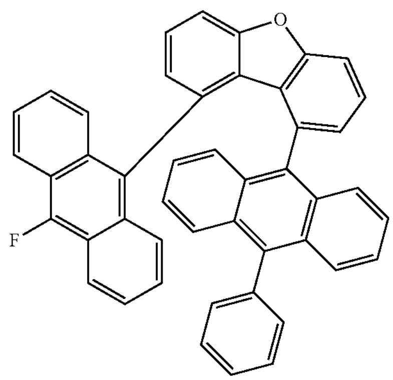
963
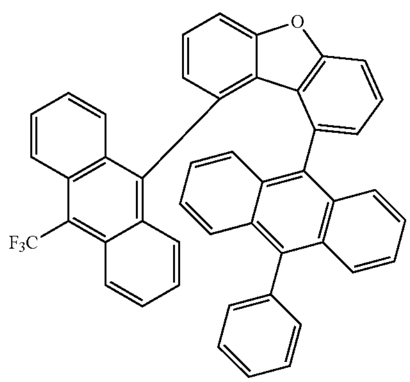
964
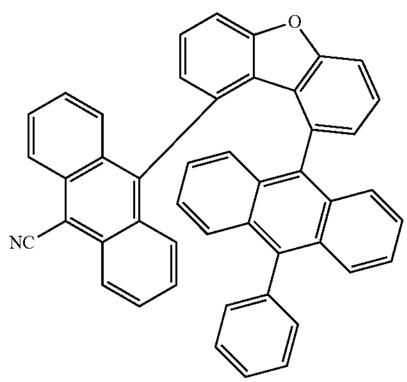
965
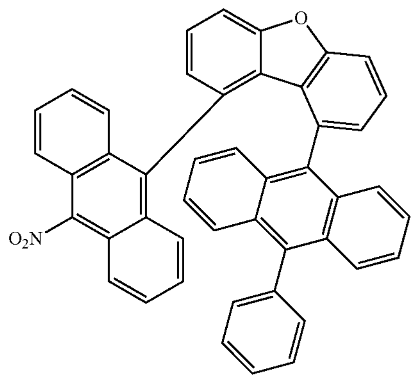
966
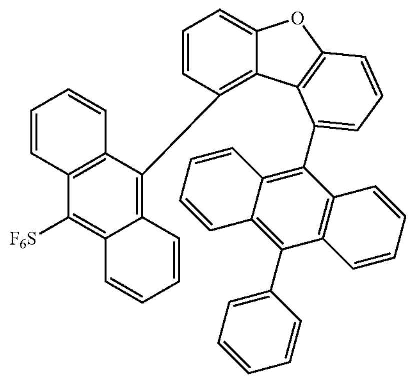
967
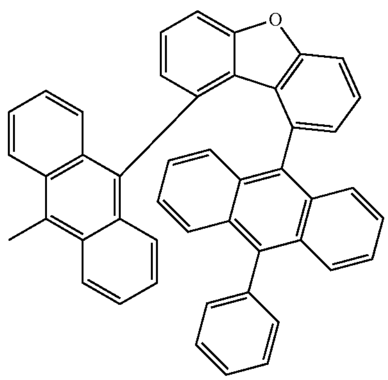
968
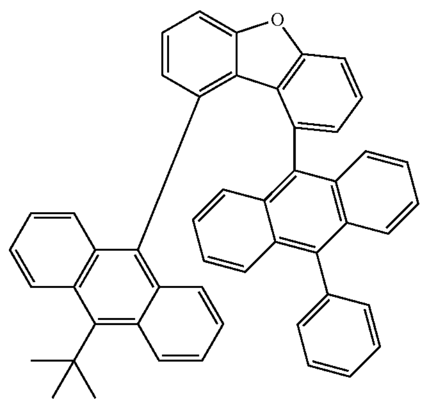

-continued
969
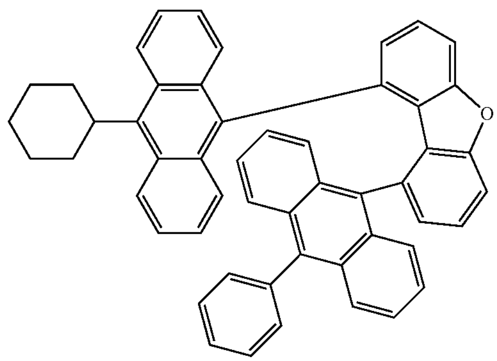
970
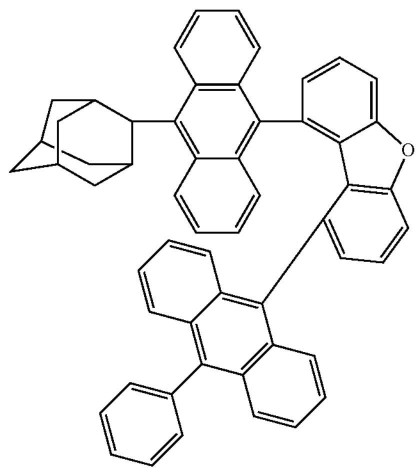
971
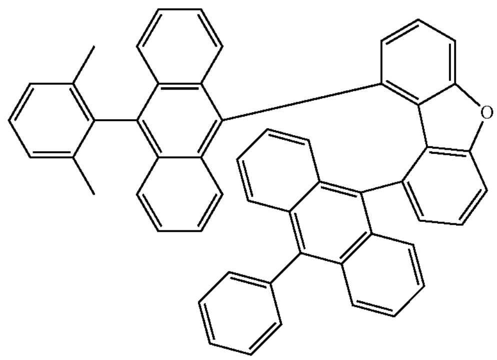
972
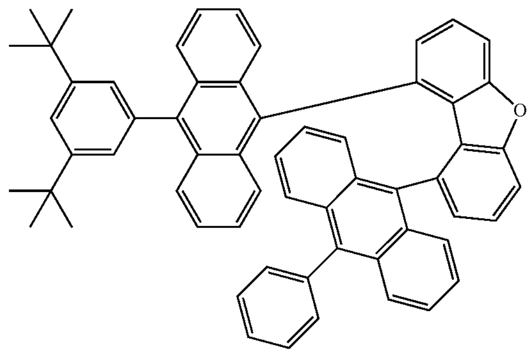
973
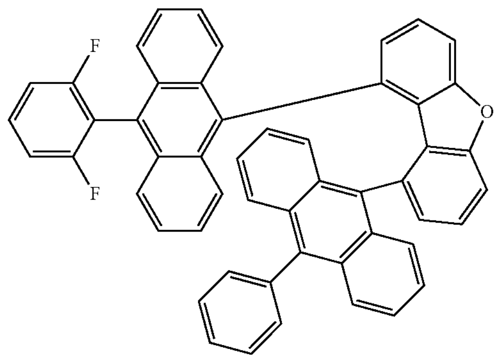
974
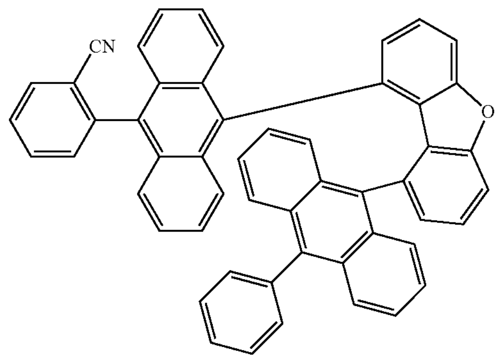
975
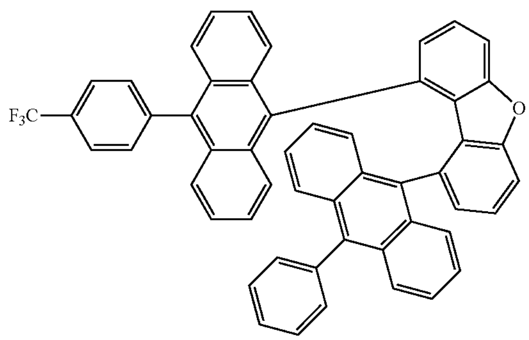
976
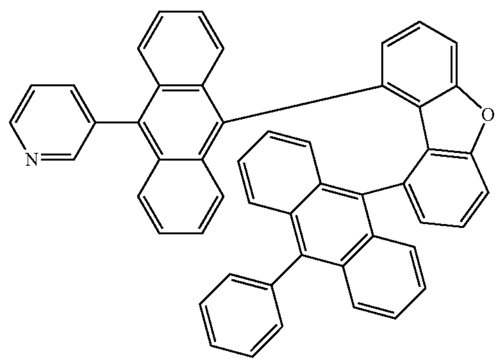

-continued
977
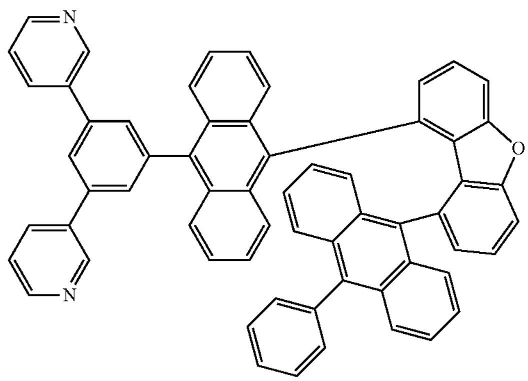
978
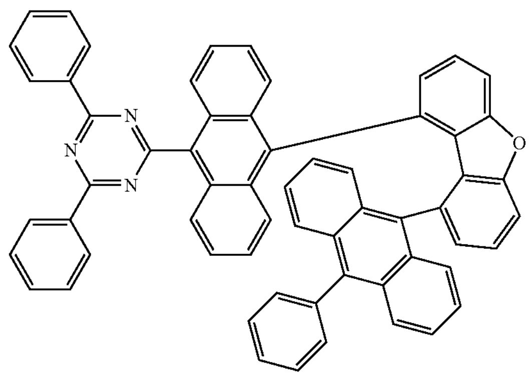
979
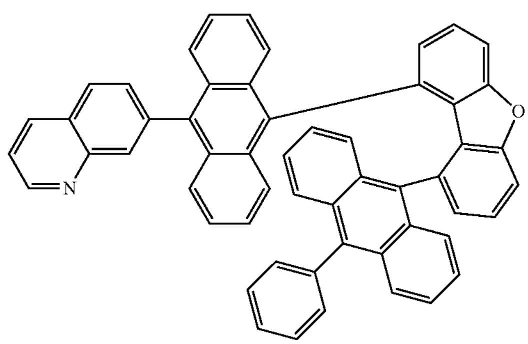
980
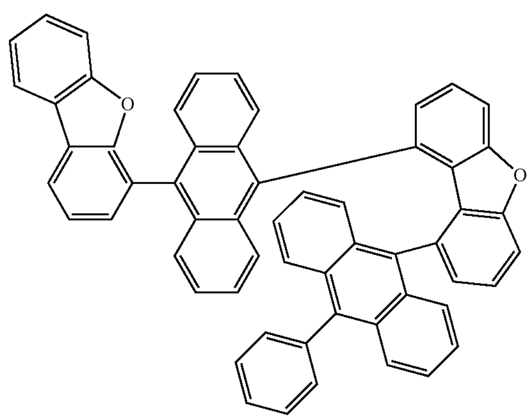
981
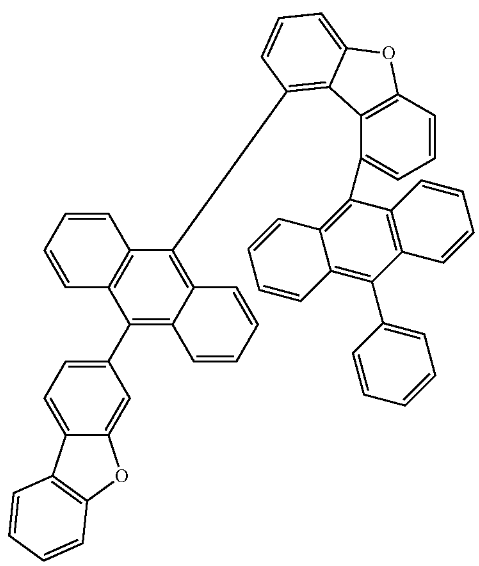
982
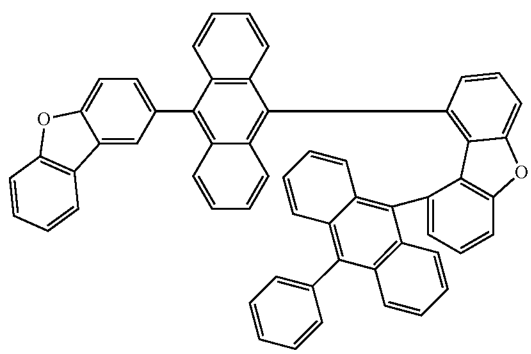

-continued
983
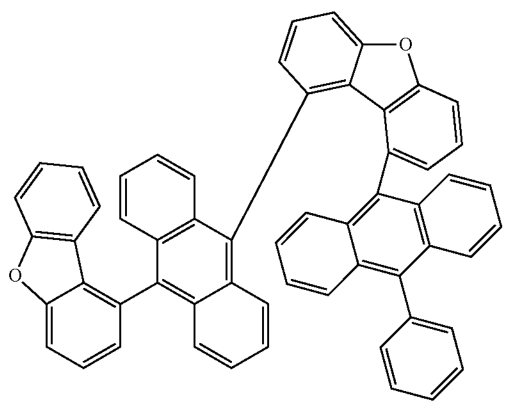
984
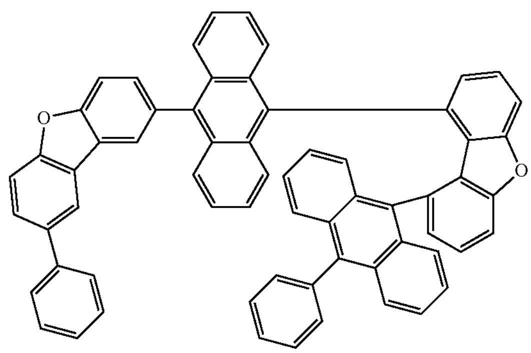
985
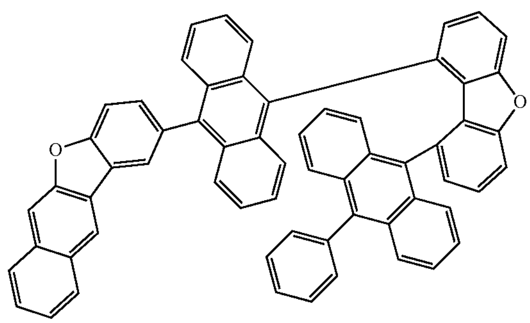
986
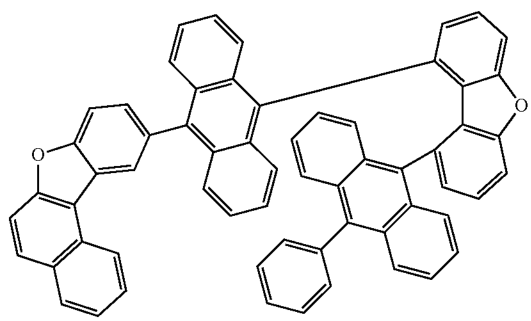
987
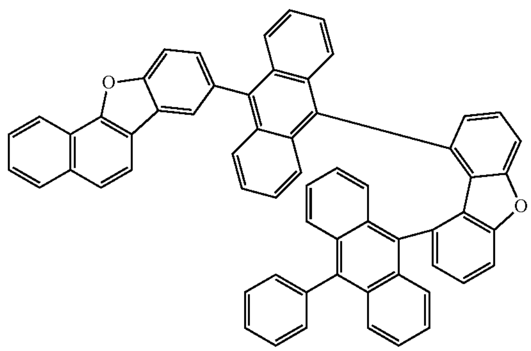
988
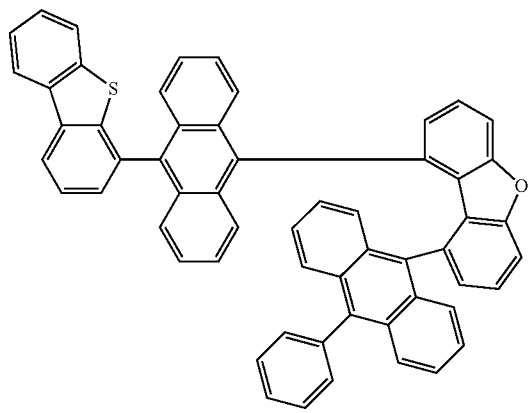

-continued
989
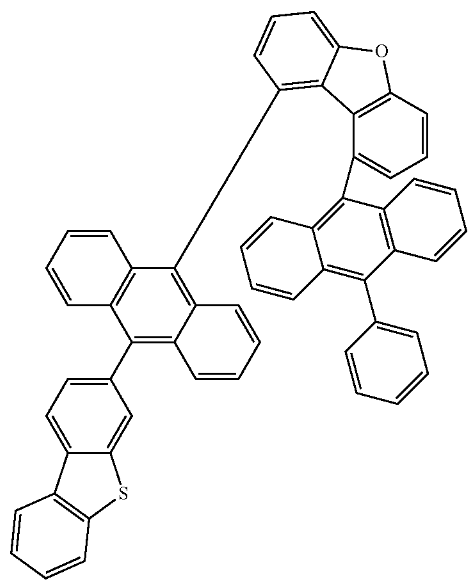
990
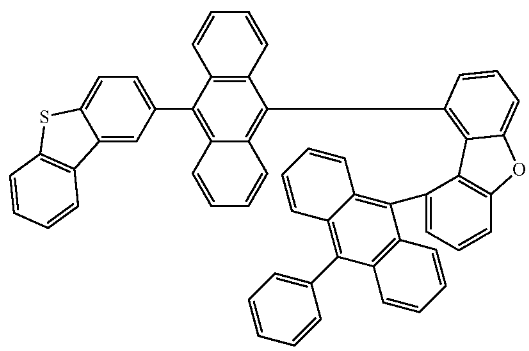
991
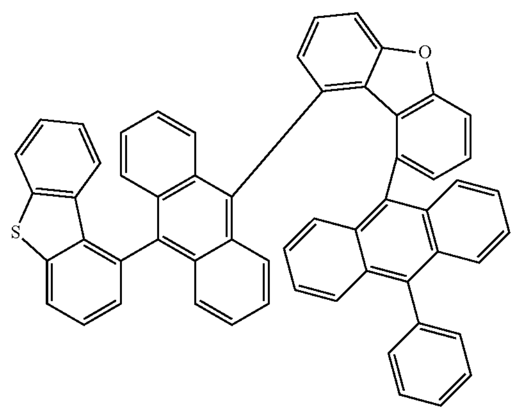
992
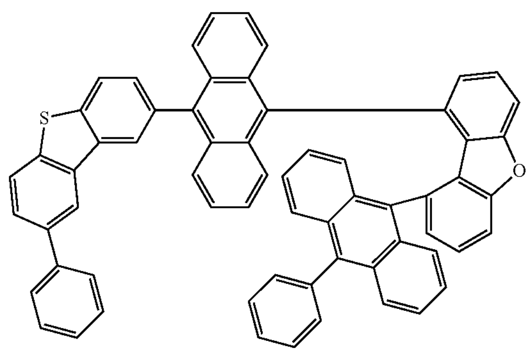
993
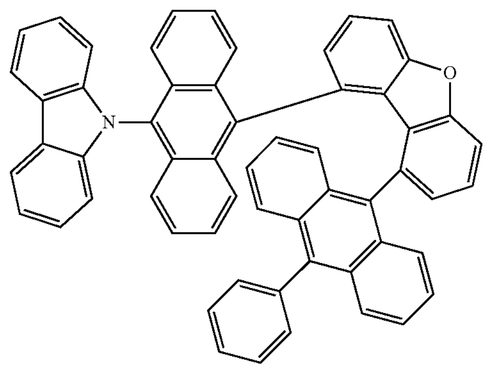
994
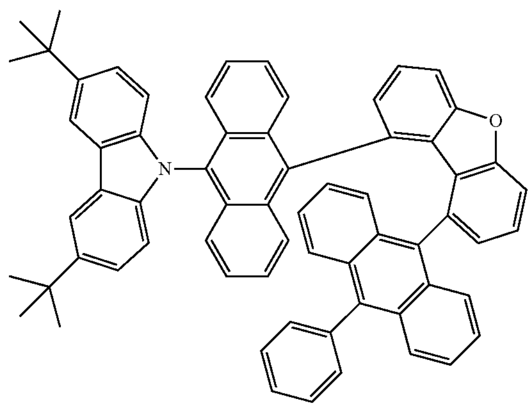

-continued
995
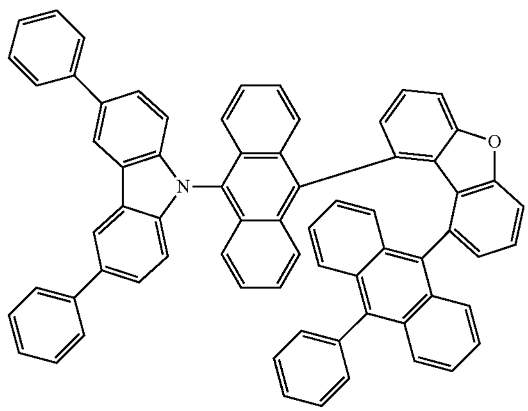
996
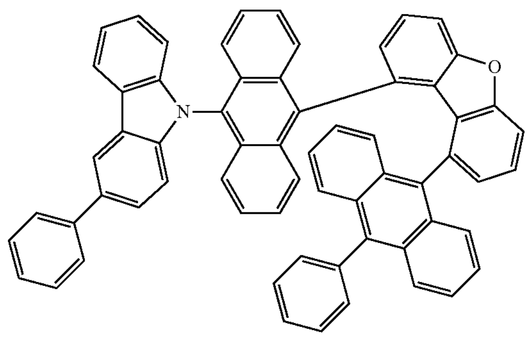
997
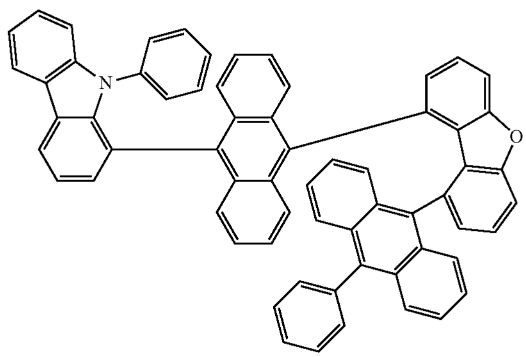
998
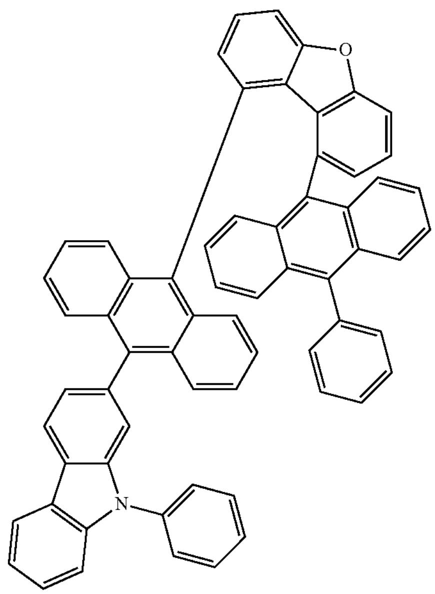
999
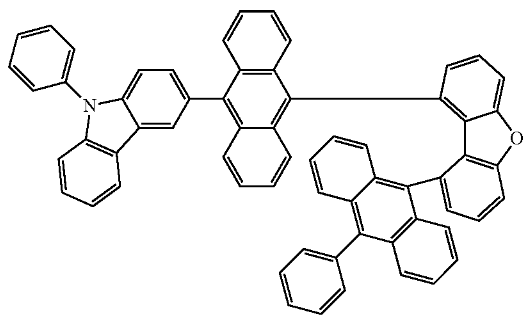
1000
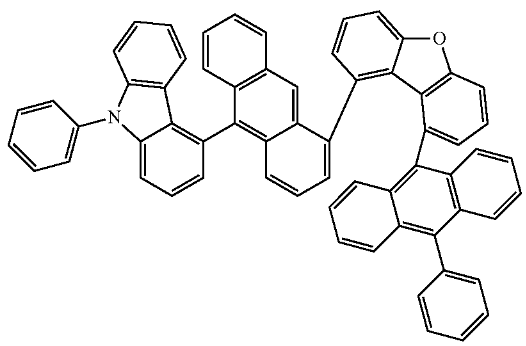

-continued
1001
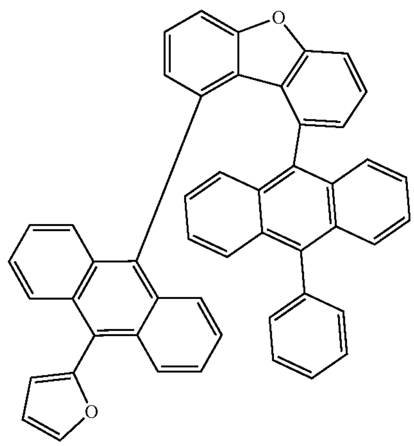
1002
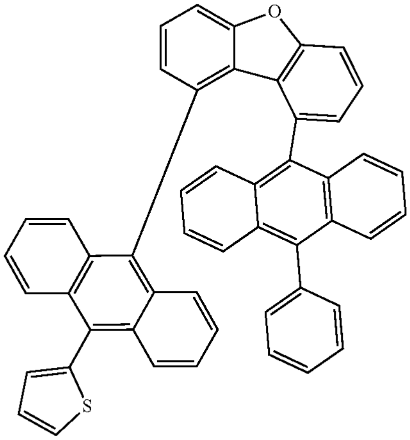
1003
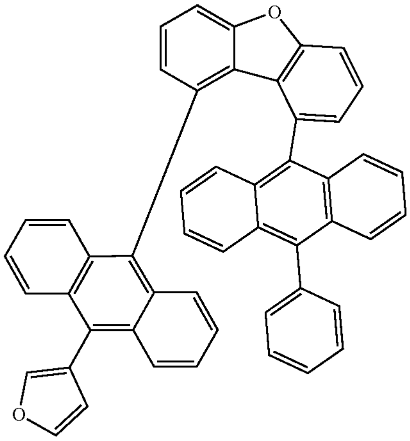
1004
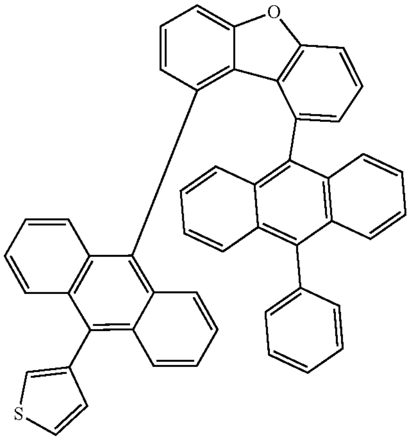
1005
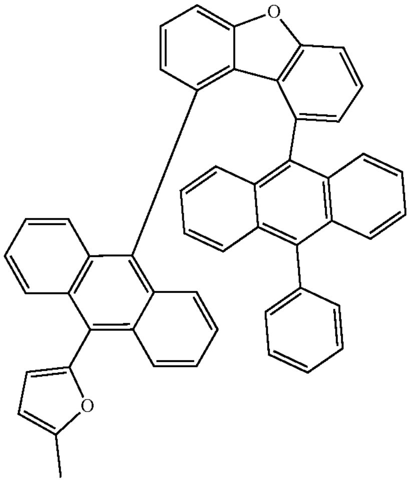
1006
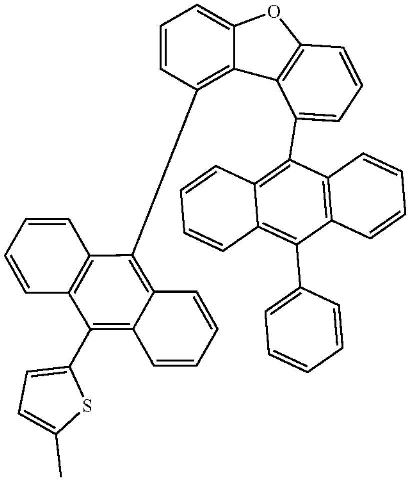

-continued
1007
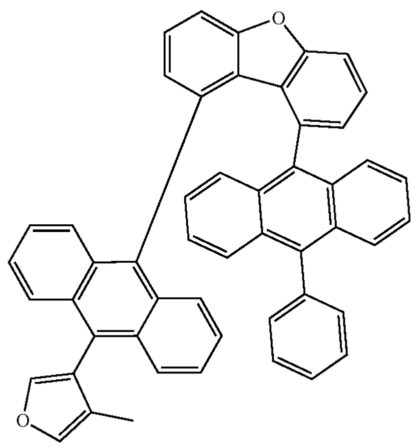
1008
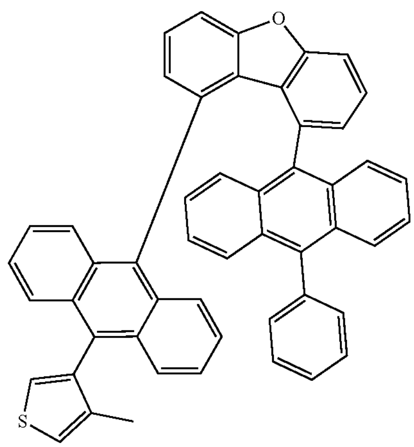
1009
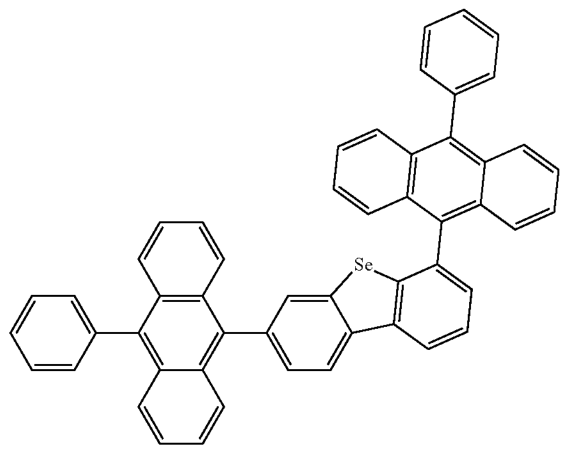
-continued
1010
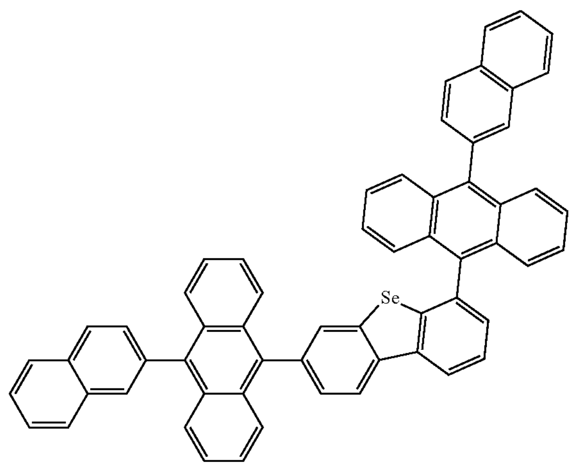
1011
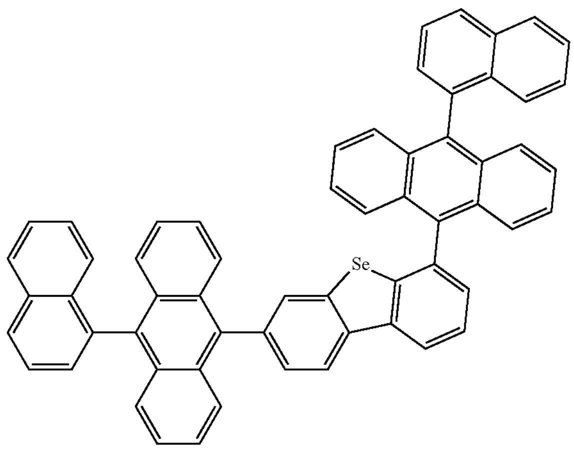
1012
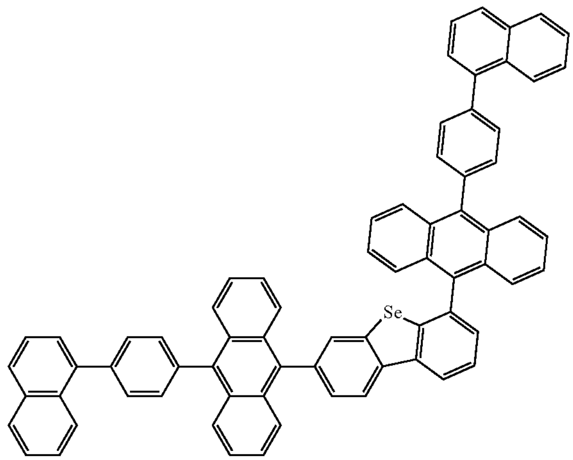

-continued
1013
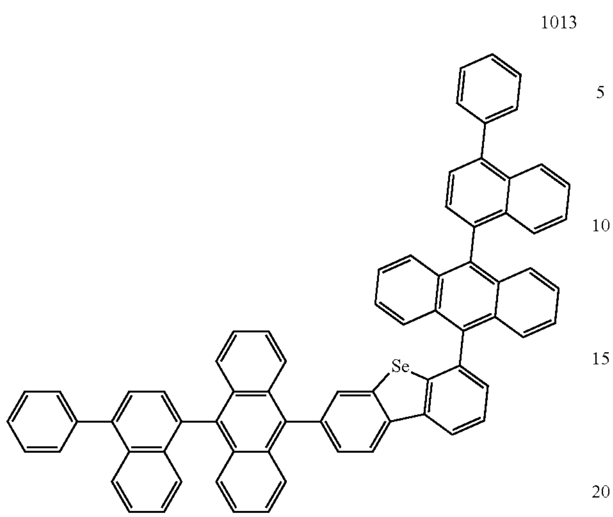
1014
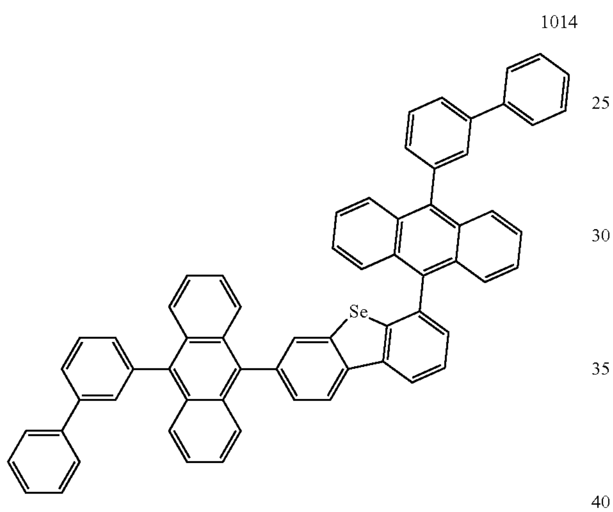
1015
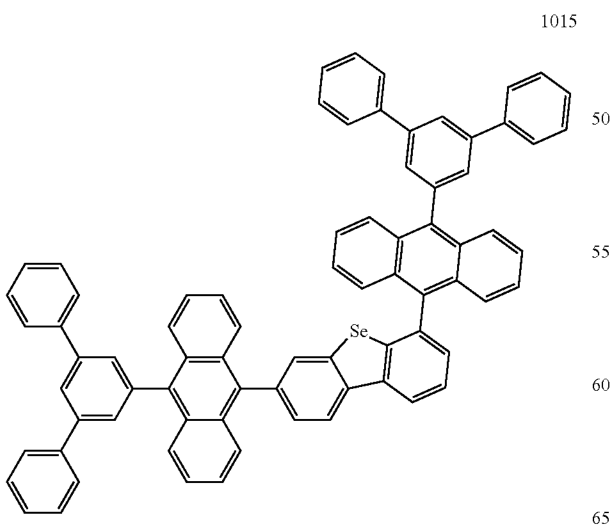
-continued
1016
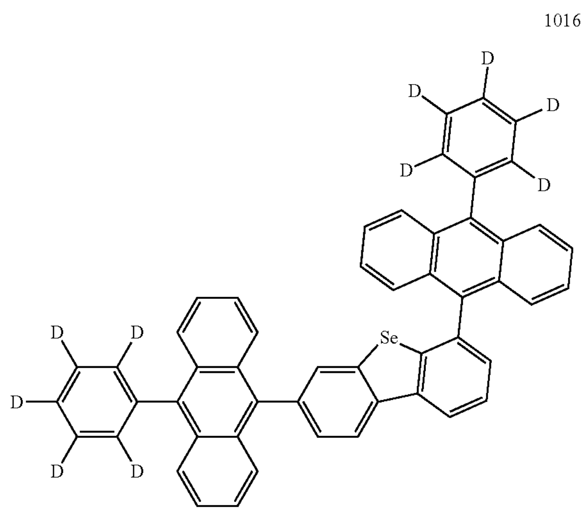
1017
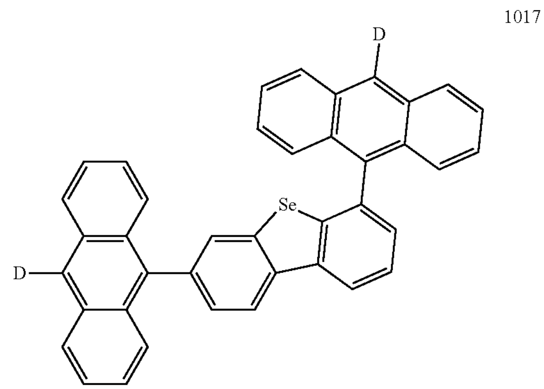
1018
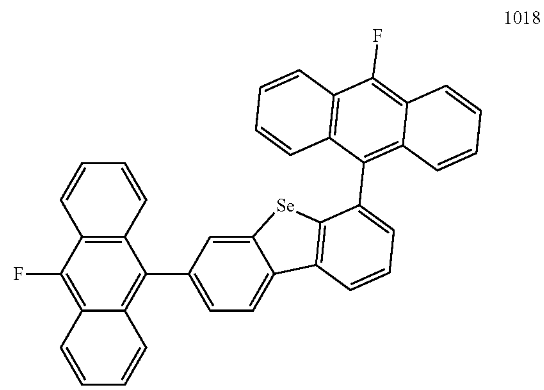
1019
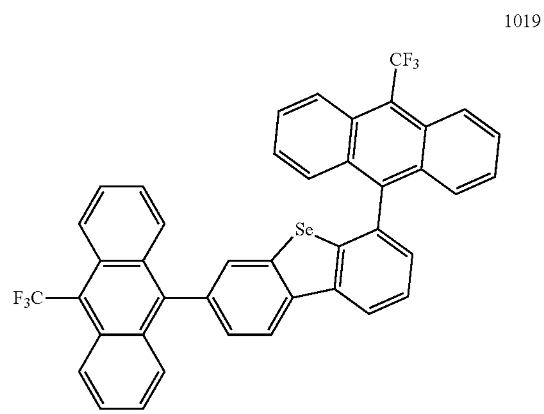

1020
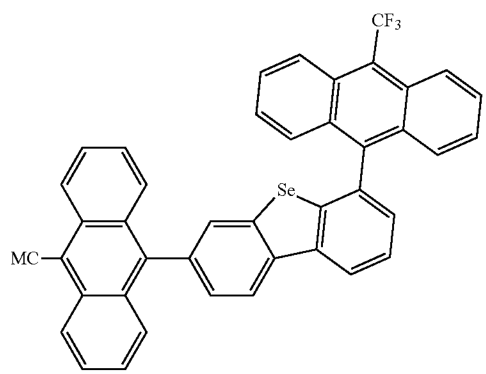
1021
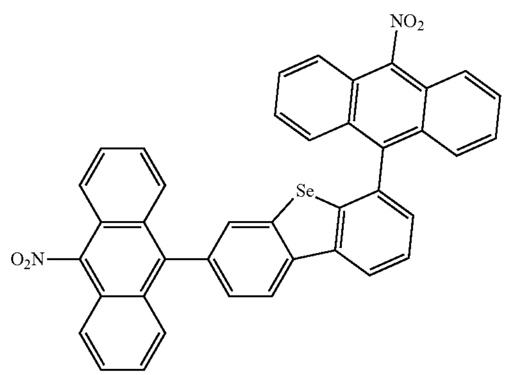
1022
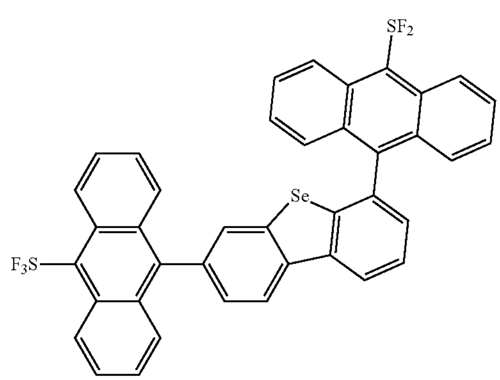
1023
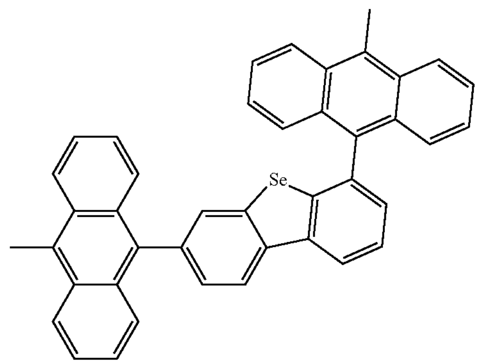
1024
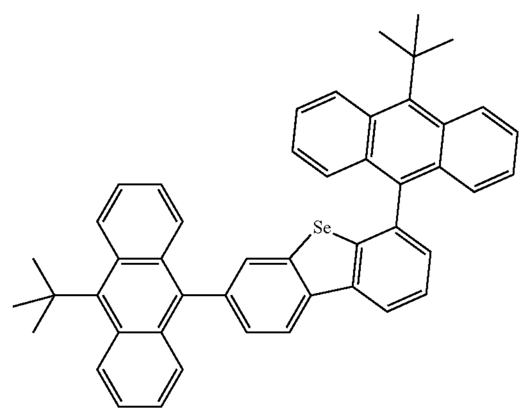
1025
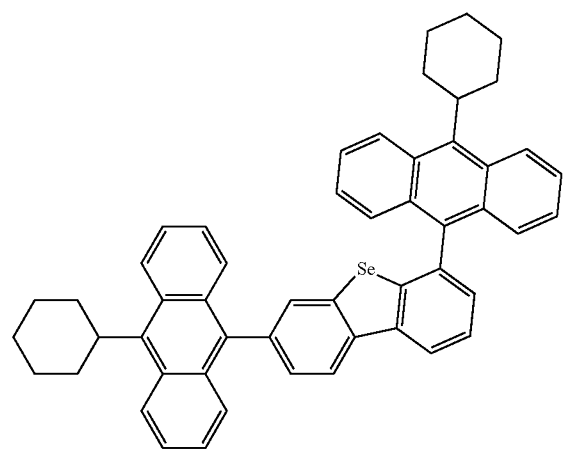
1026
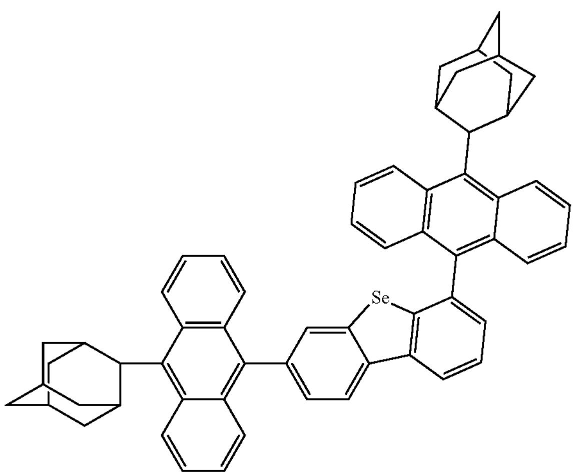

-continued
1027
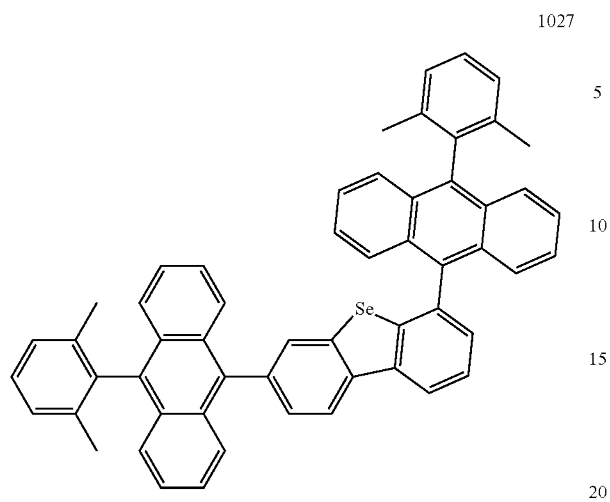
1028
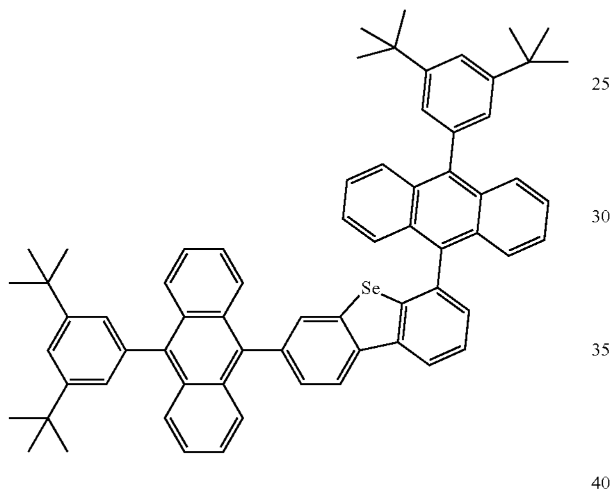
1029
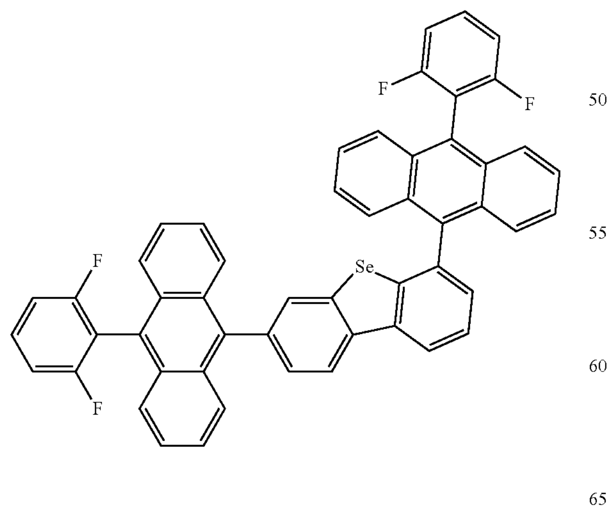
-continued
1030
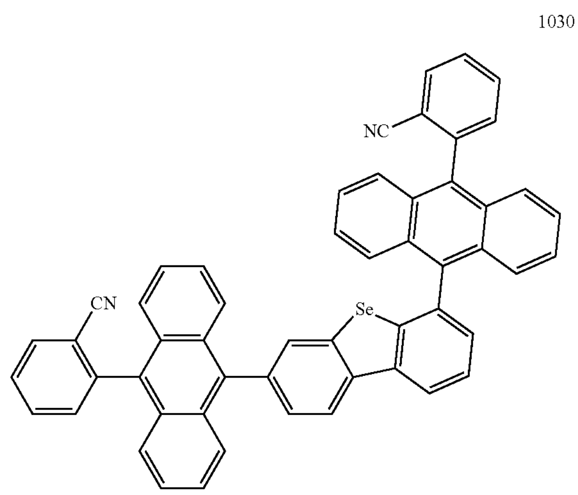
1031
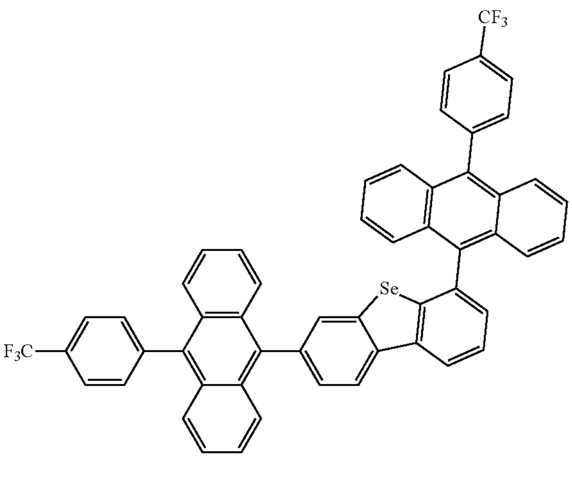
1032
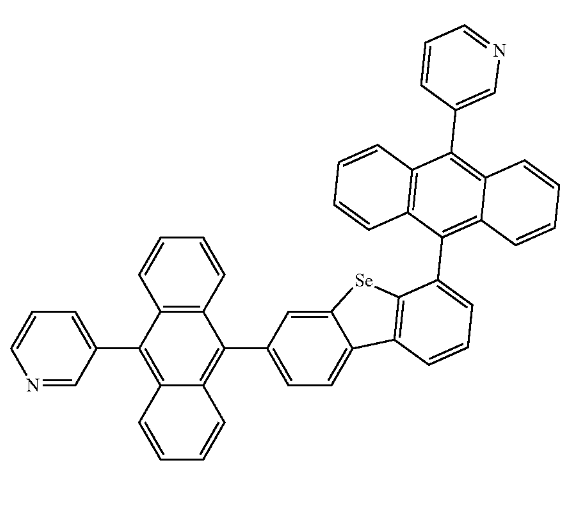

1033
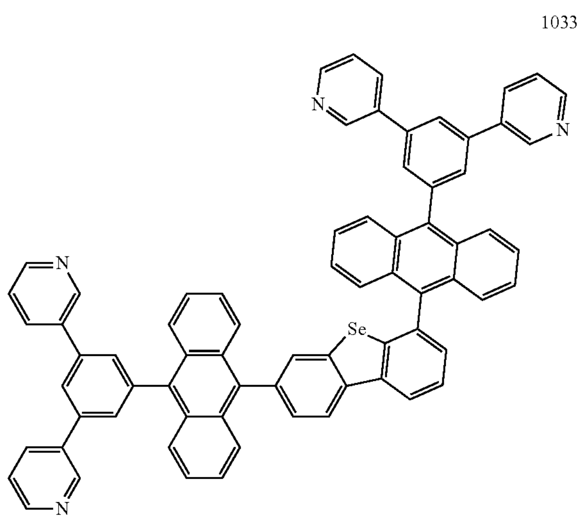
1034
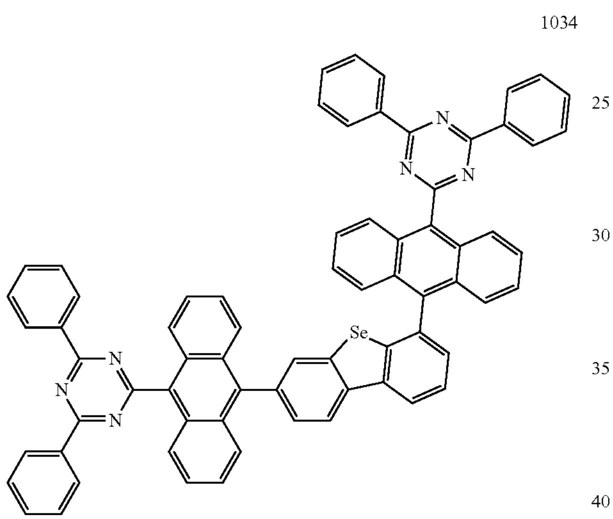
1035
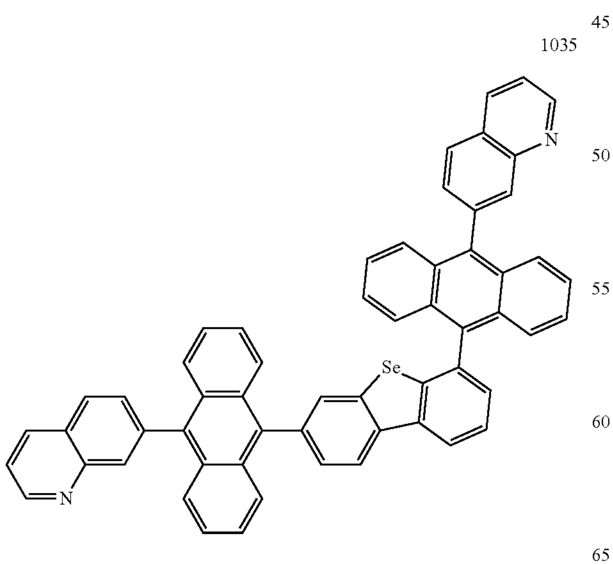
1036
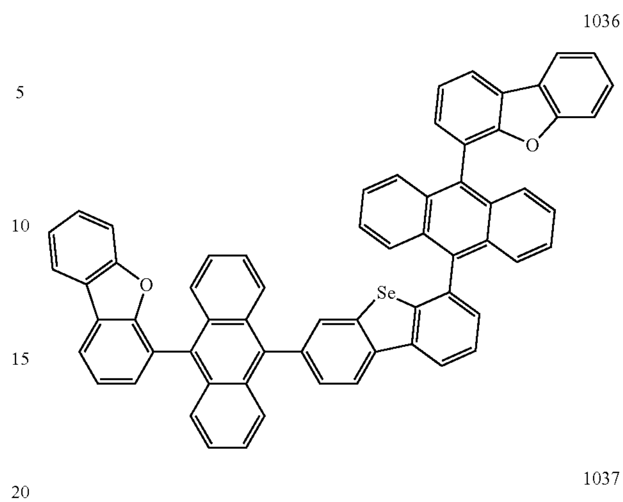
1037
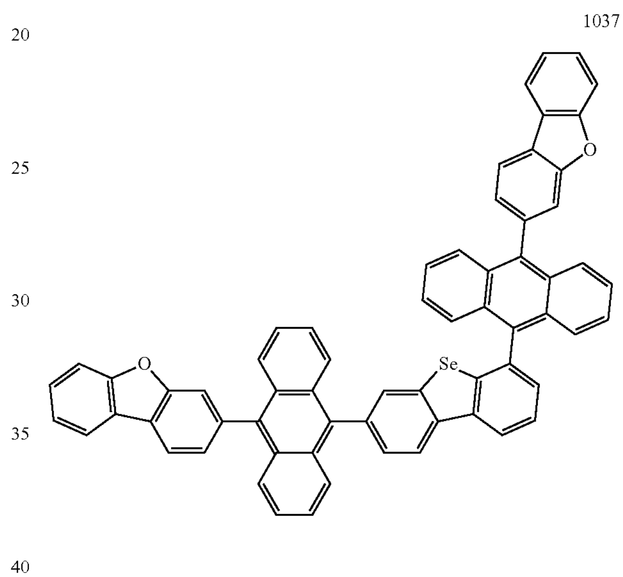
1038
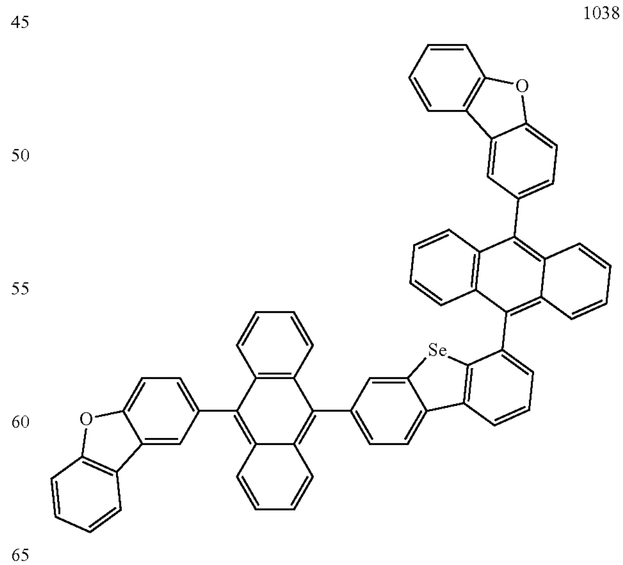

-continued
1039
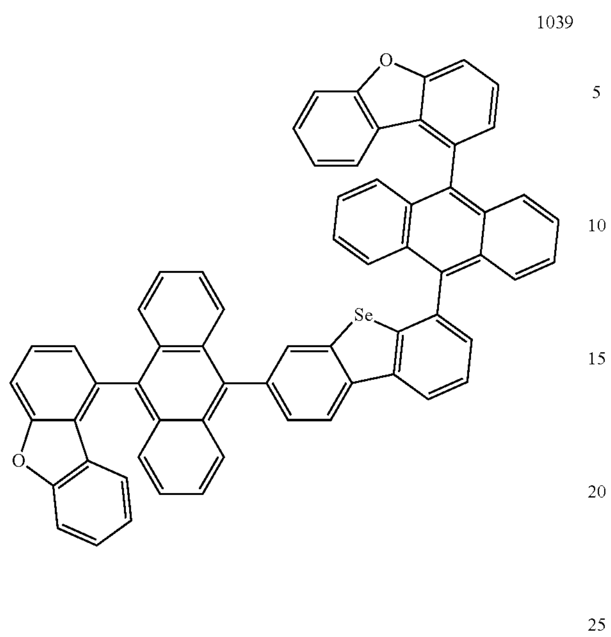
1040
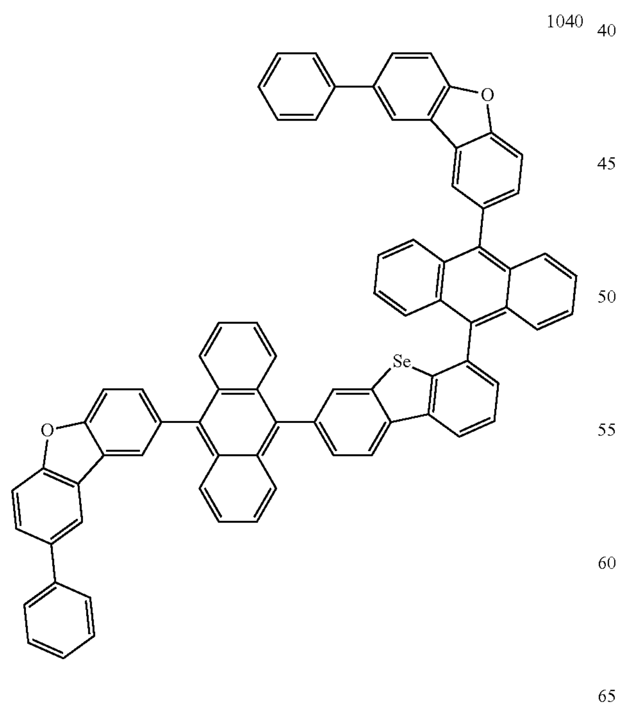
-continued
1041
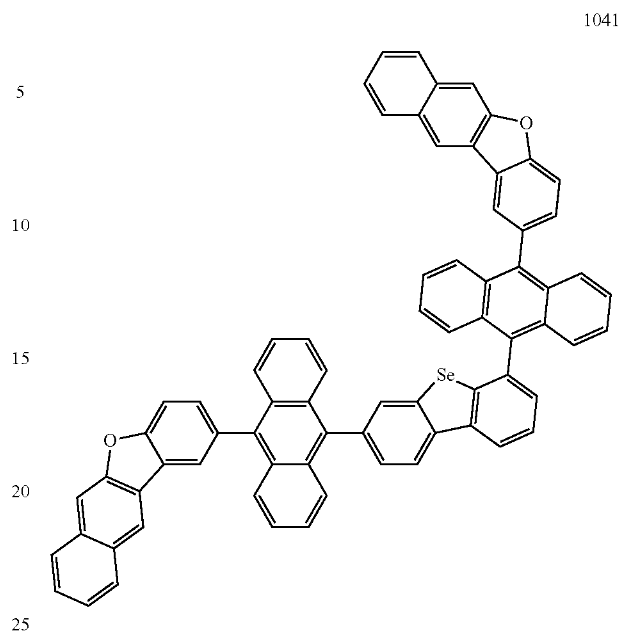
1042
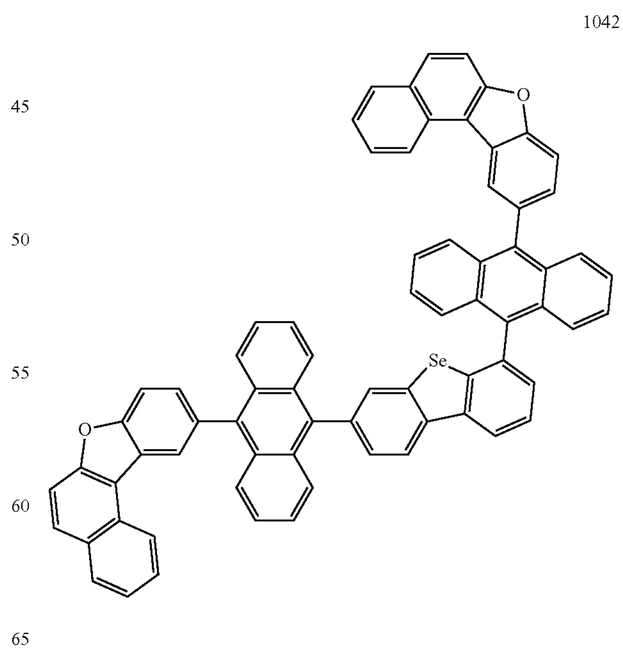

-continued
1043
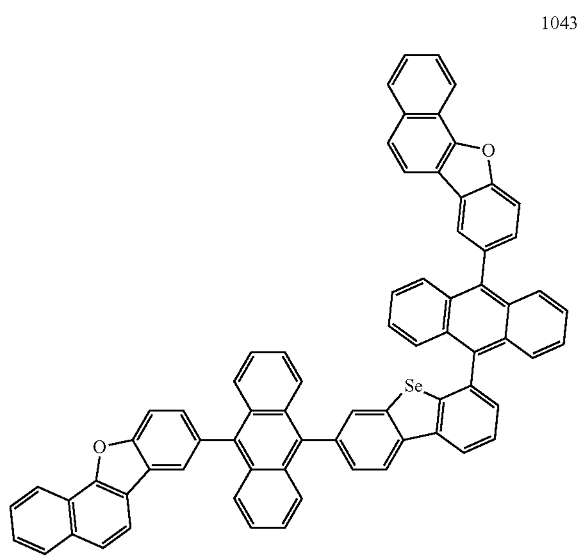
1044
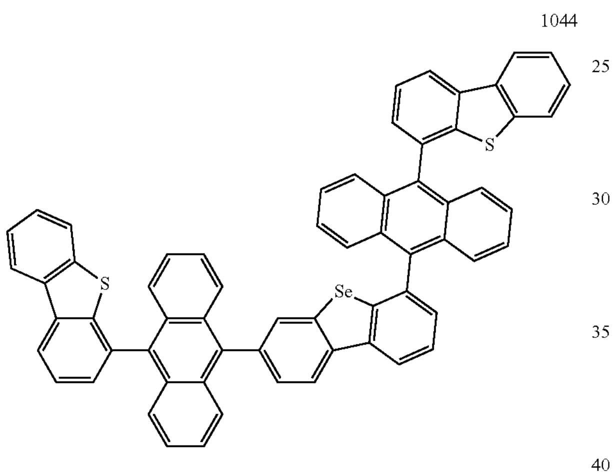
1045
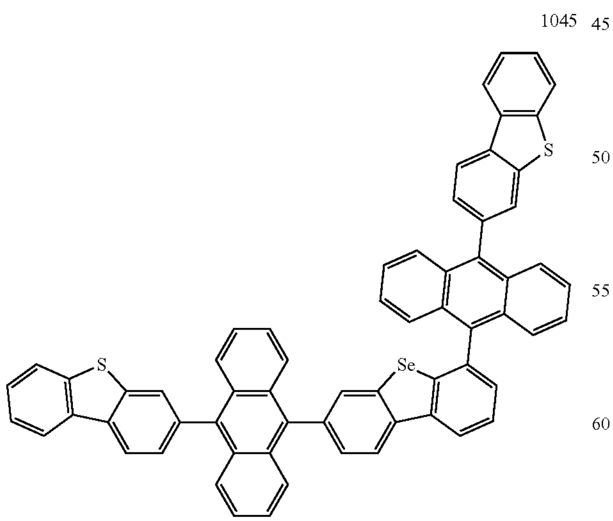
-continued
1046
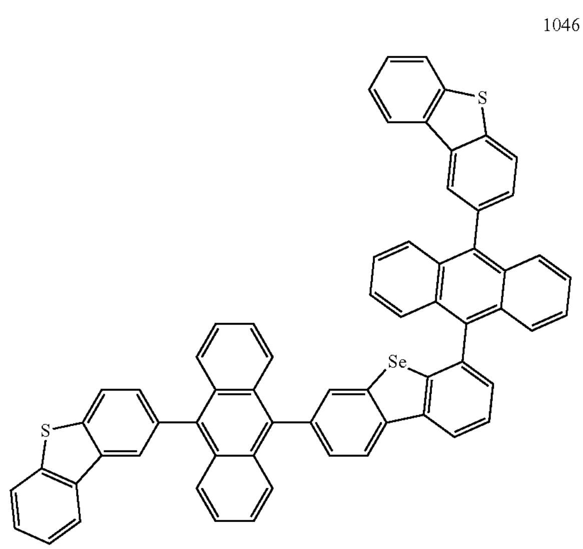
1047
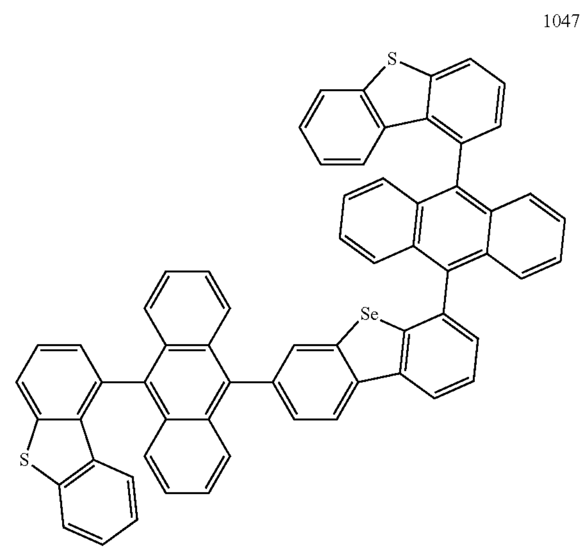

-continued
1048
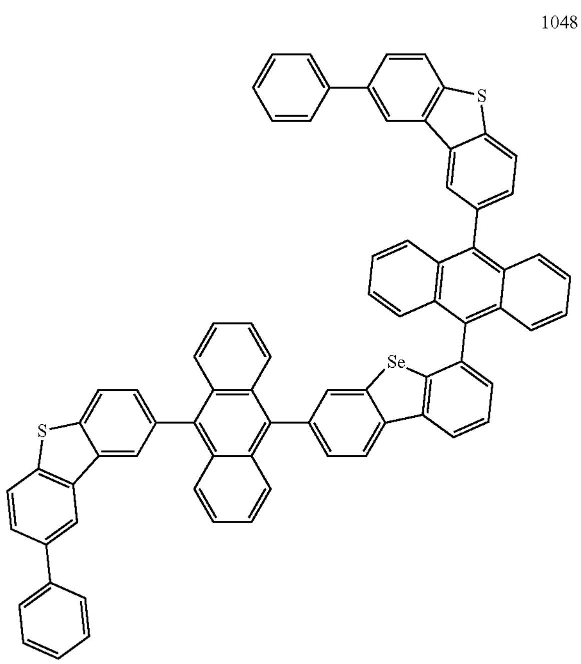
1049
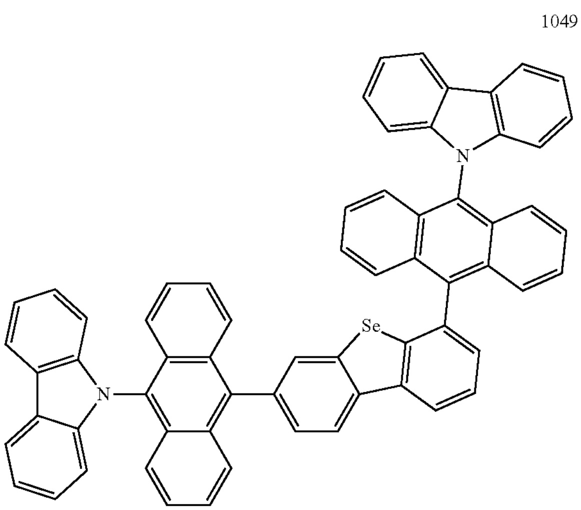
1050
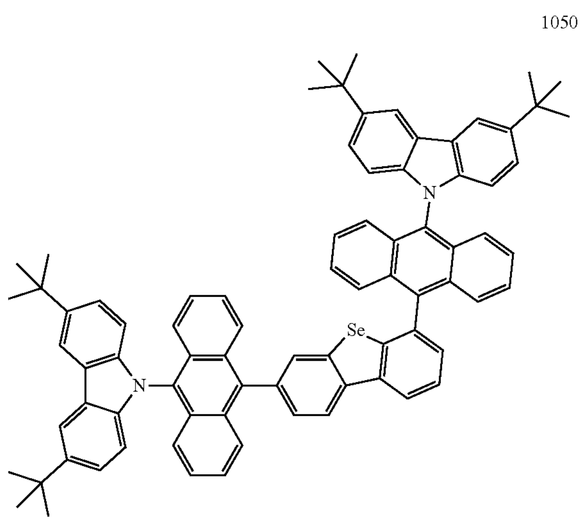
-continued
1051
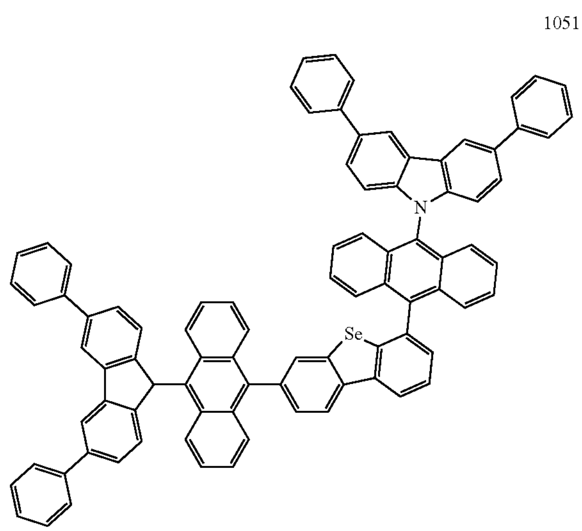
1052
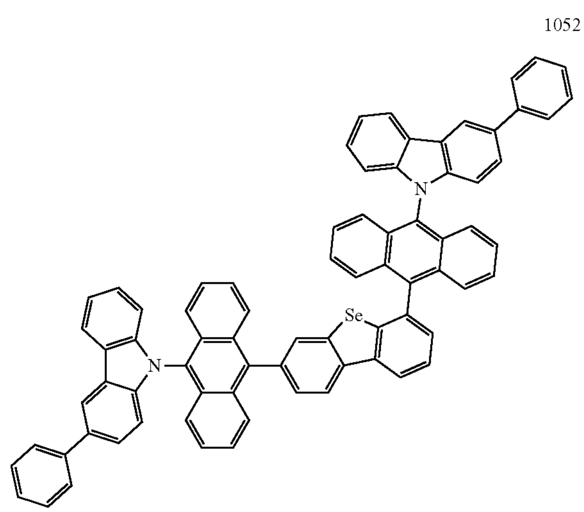
1053
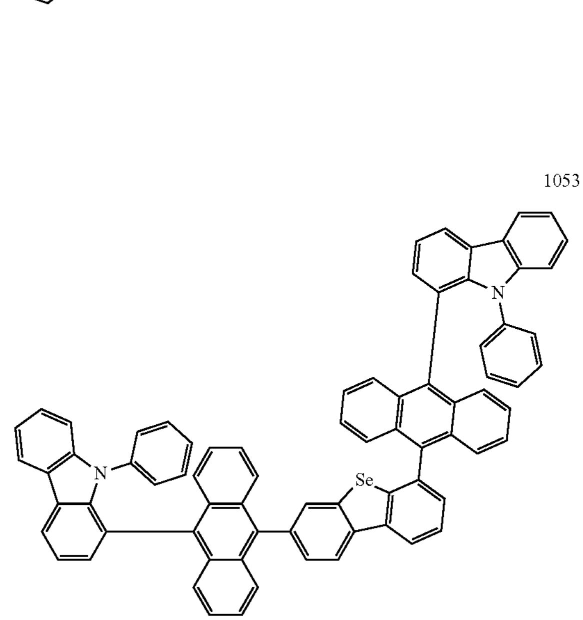

-continued
1054
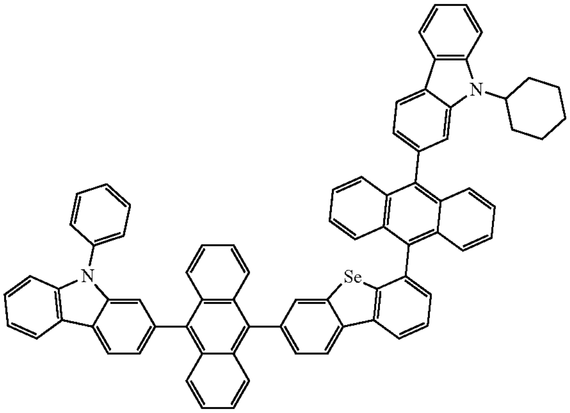
1055
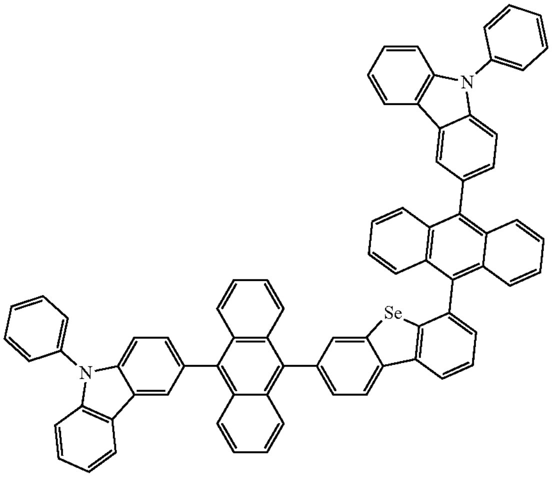
1056
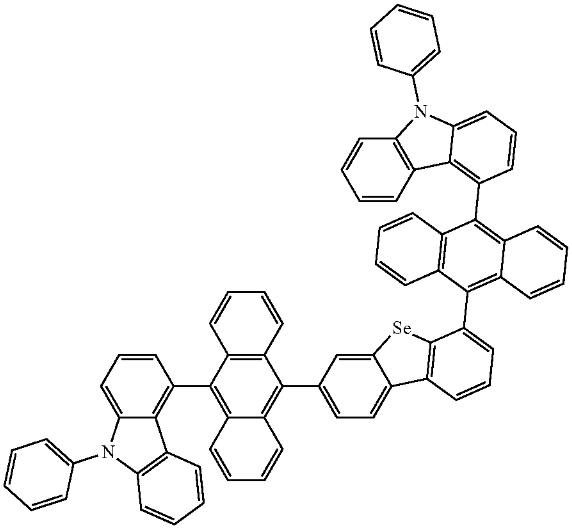
-continued
1057
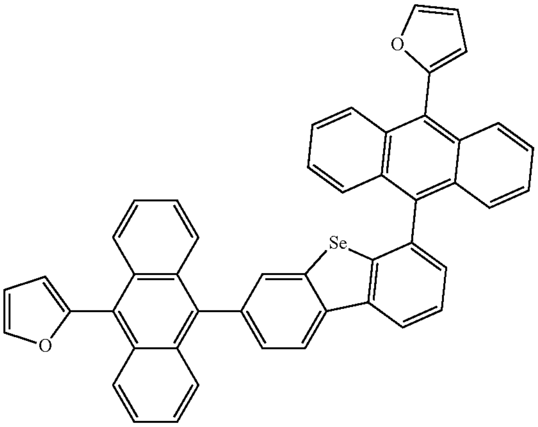
1058
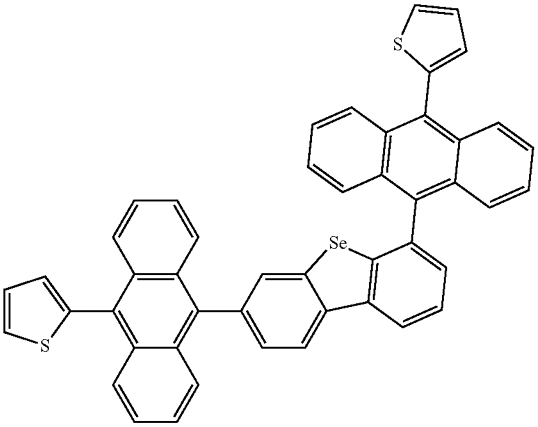
1059
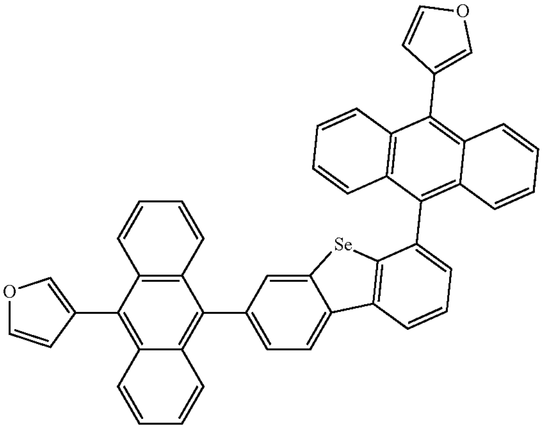

1060
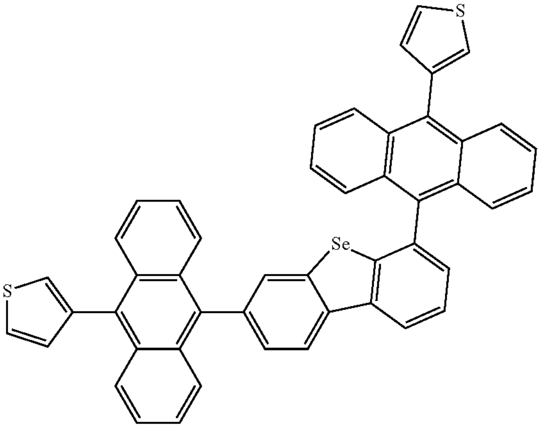
1061
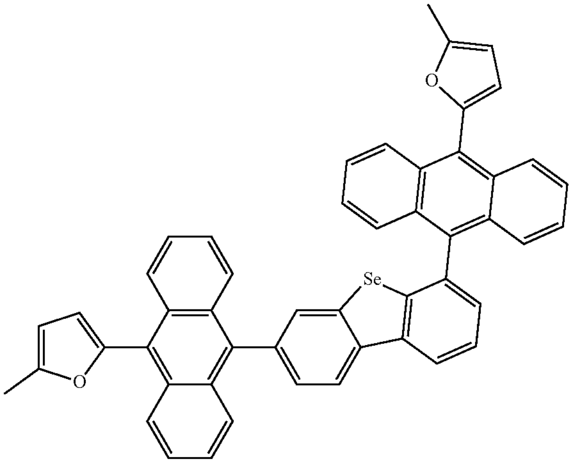
1062
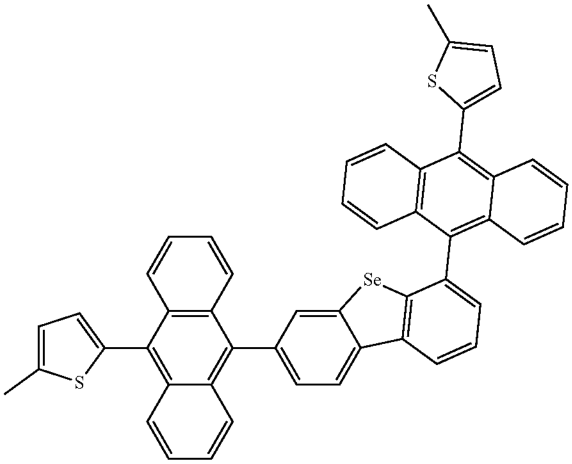
1063
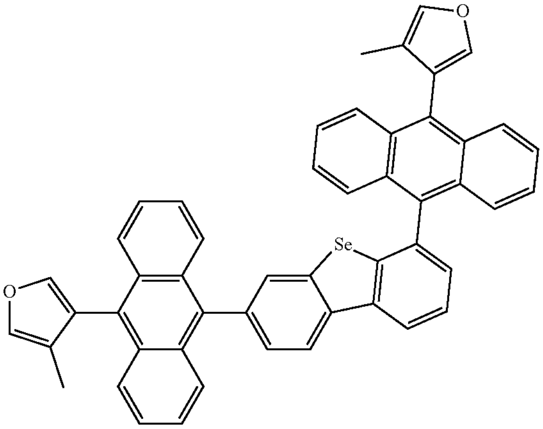
1064
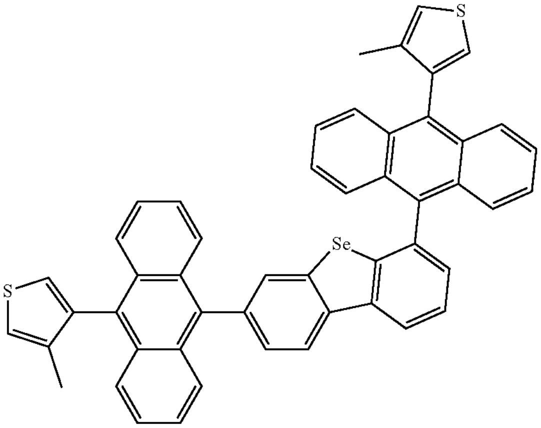
1065
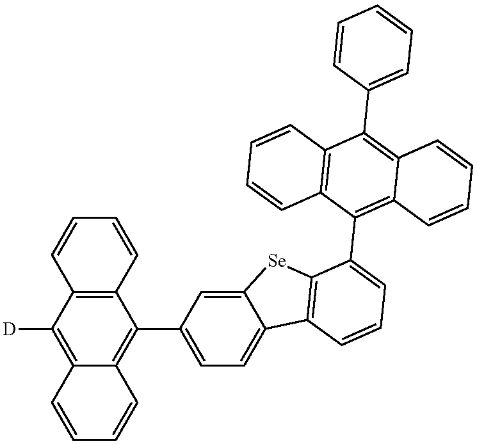

-continued
1066
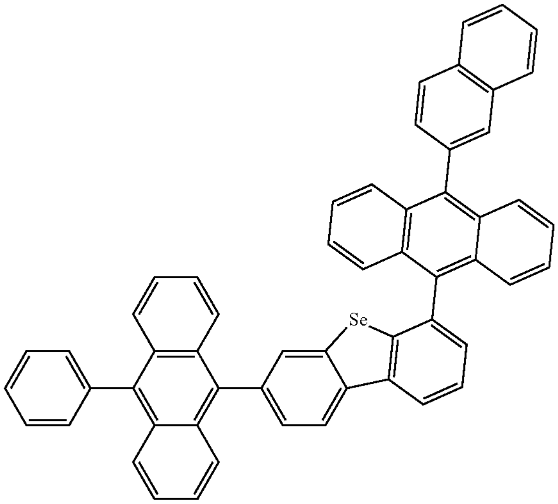
1067
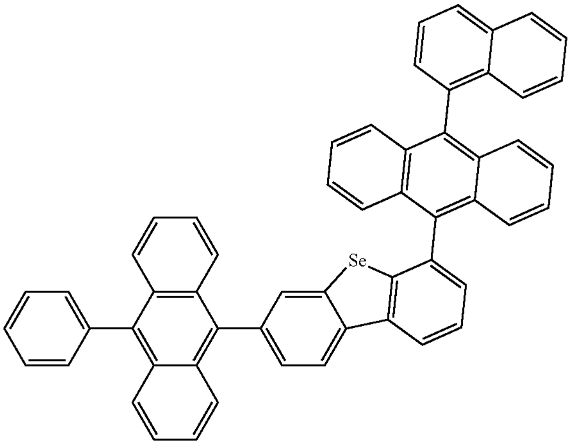
1068
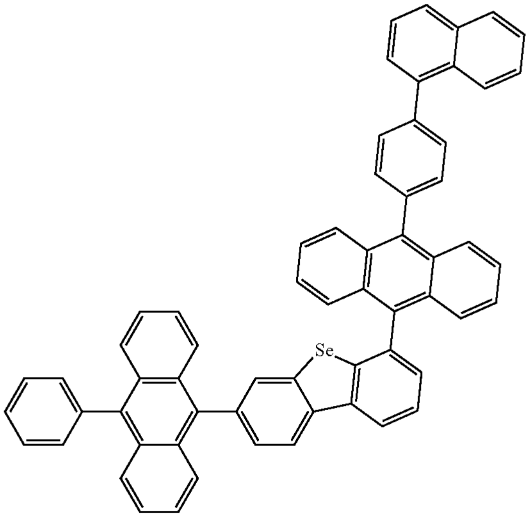
-continued
1069
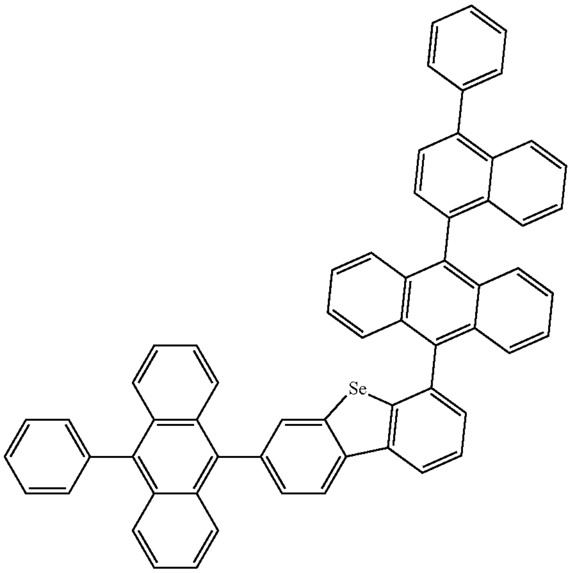
1070
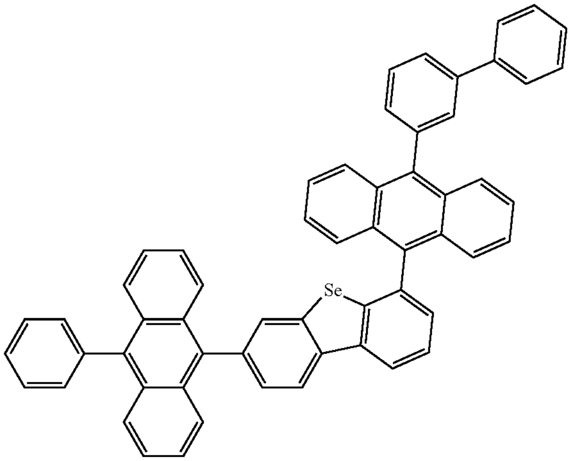
1071
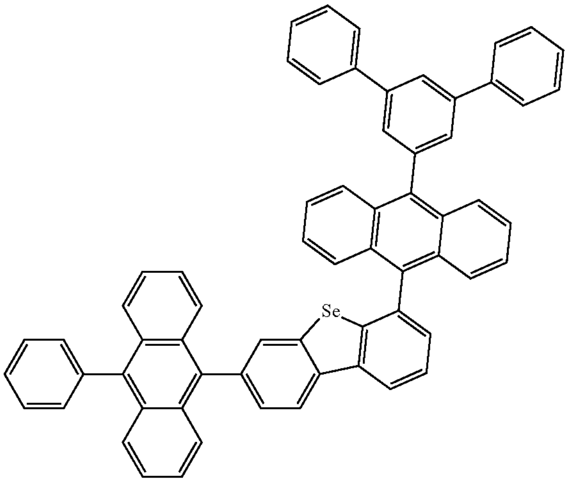

-continued
1072
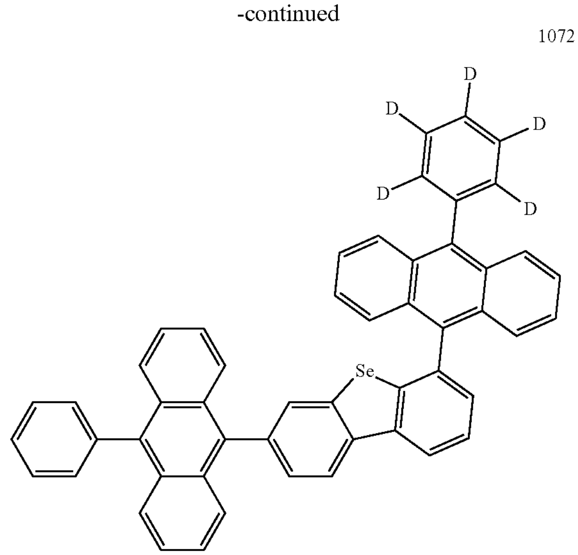
1073
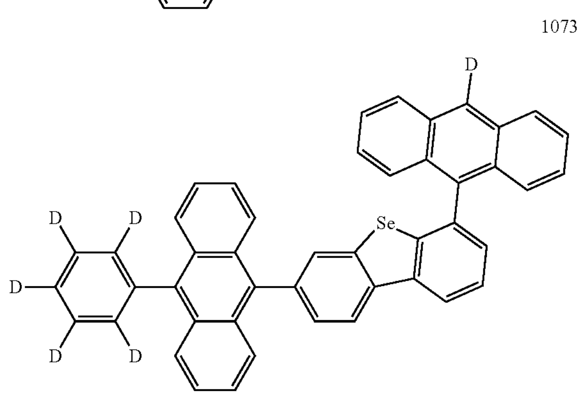
1074
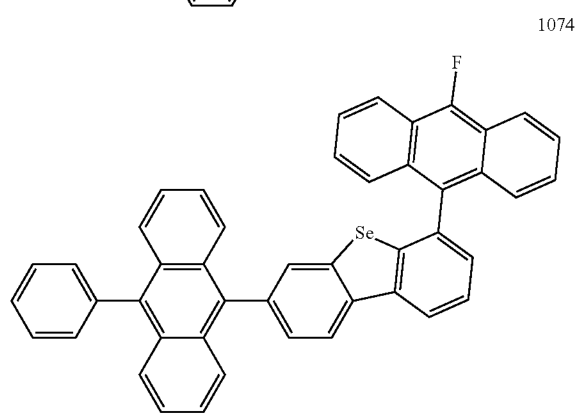
1075
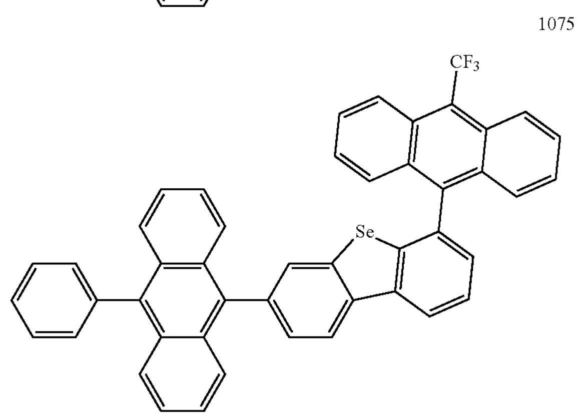
-continued
1076
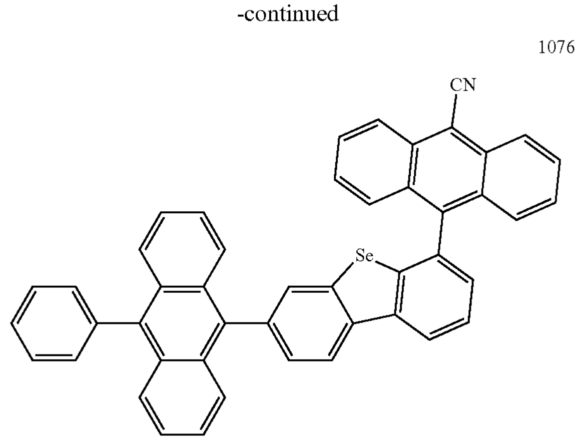
1077
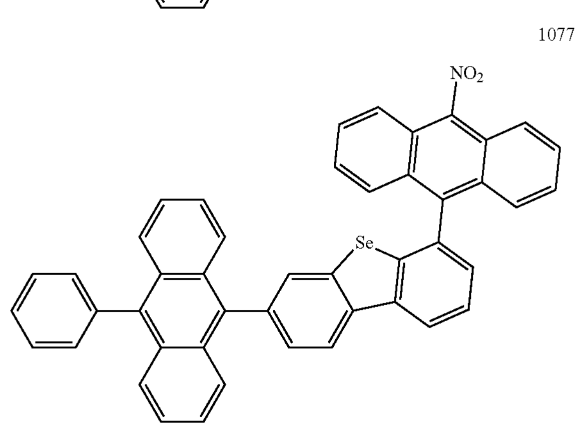
1078
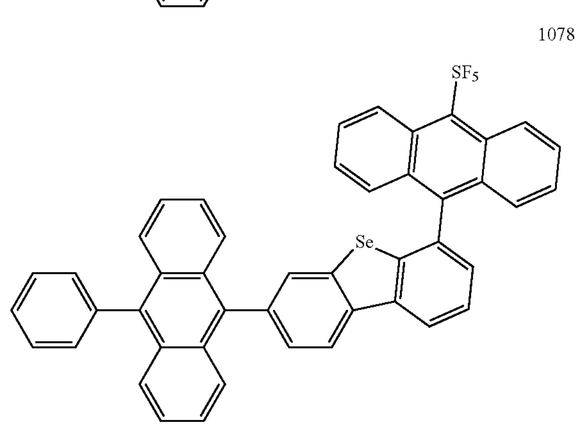
1079
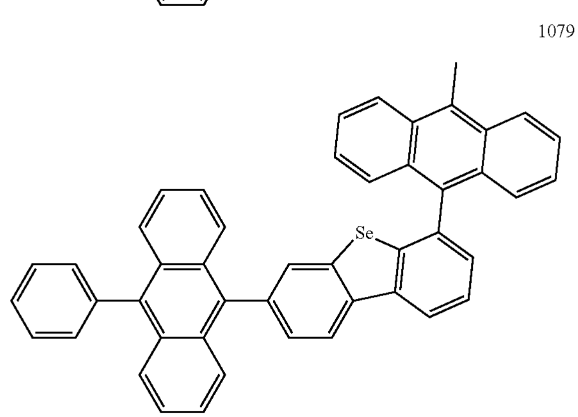

-continued
1080
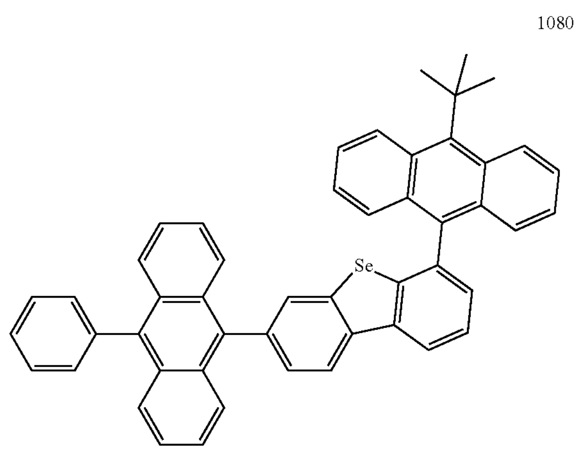
1081
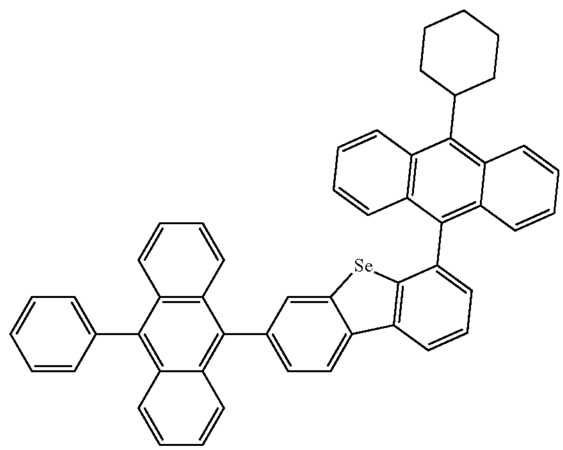
1082
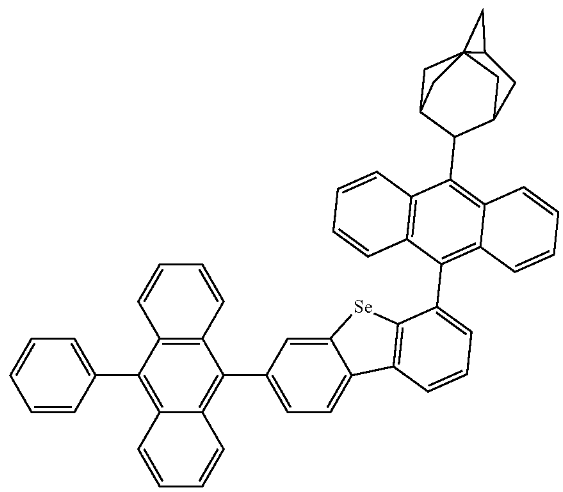
-continued
1083
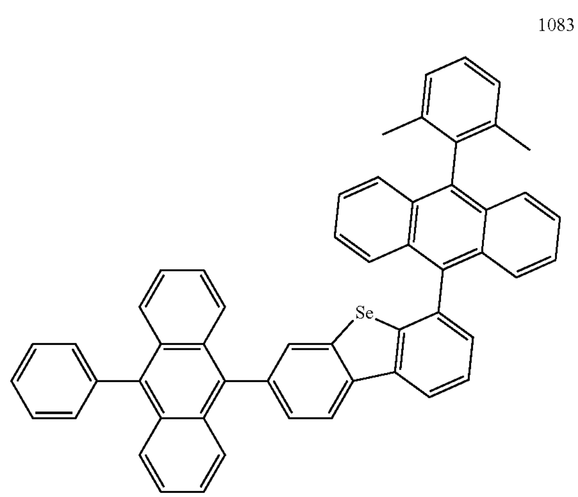
1084
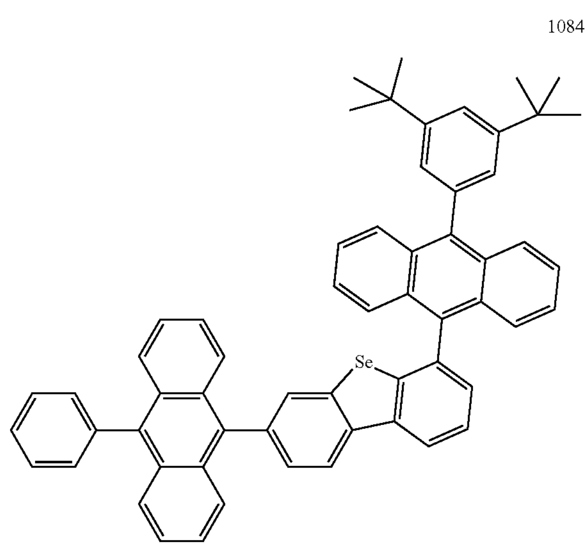
1085
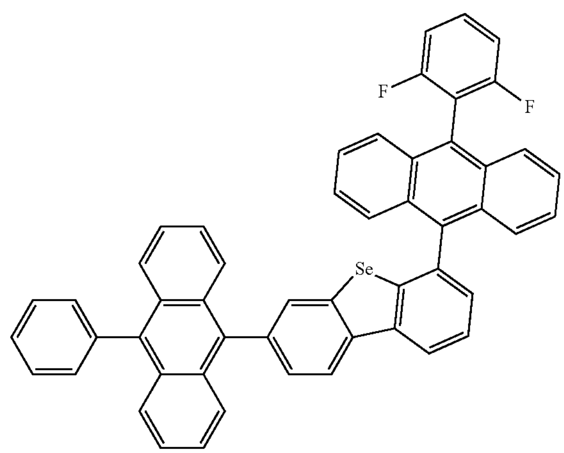

-continued
1086
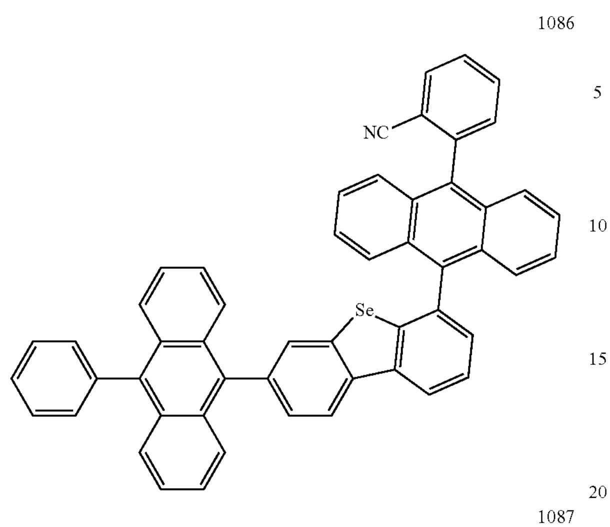
1087
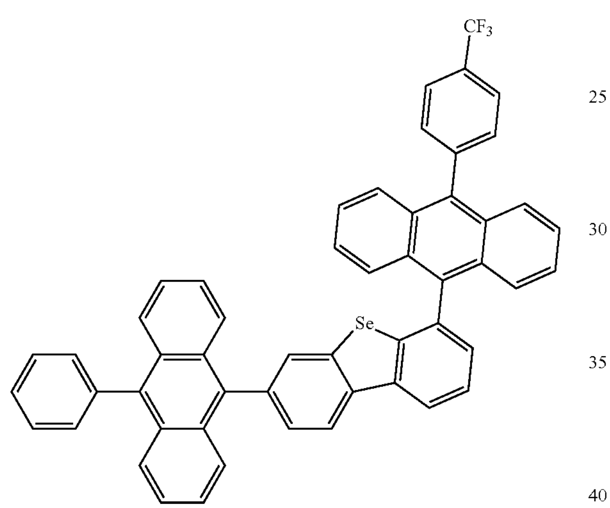
1088
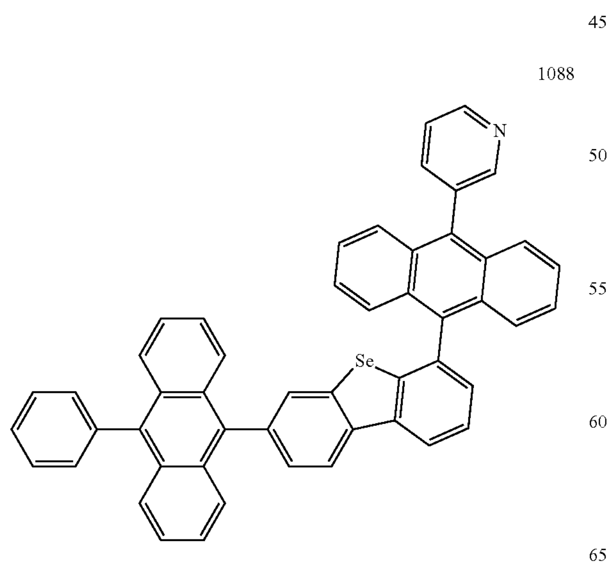
-continued
1089
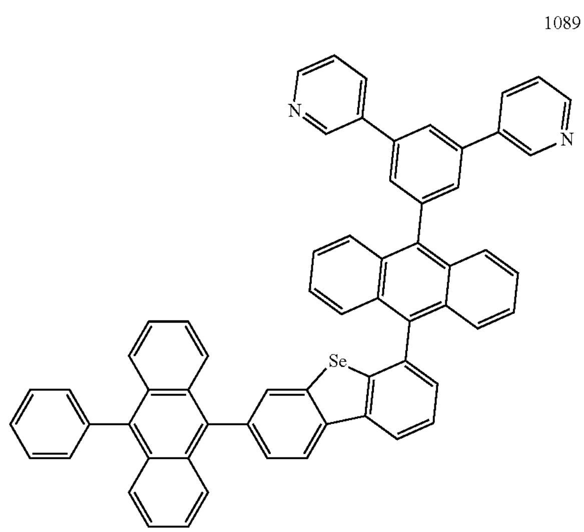
1090
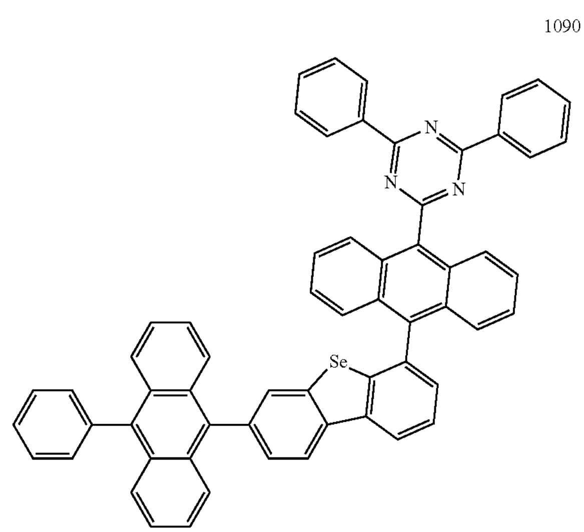
1091
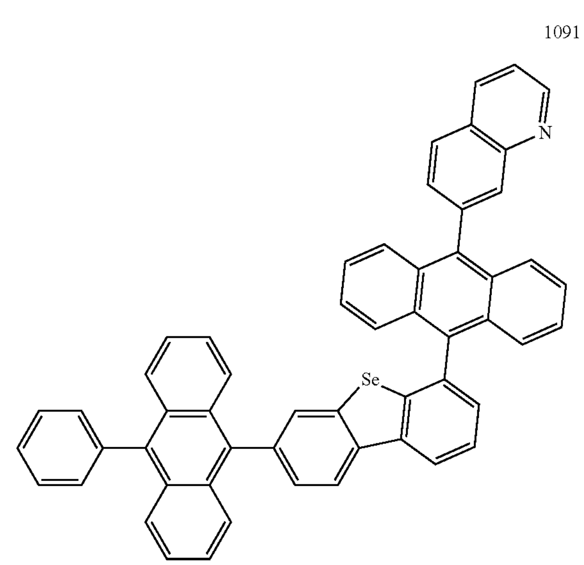

-continued
1092
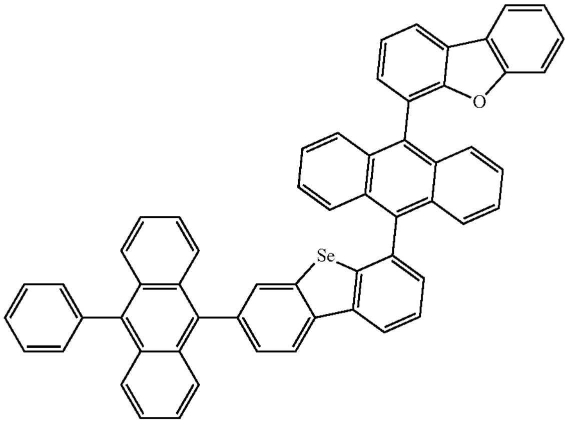
1093
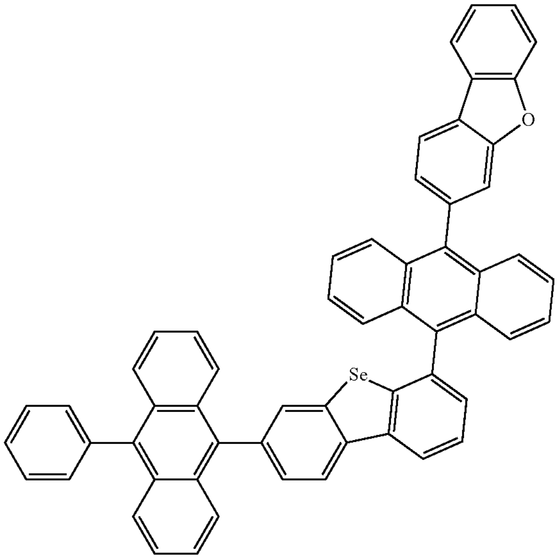
1094
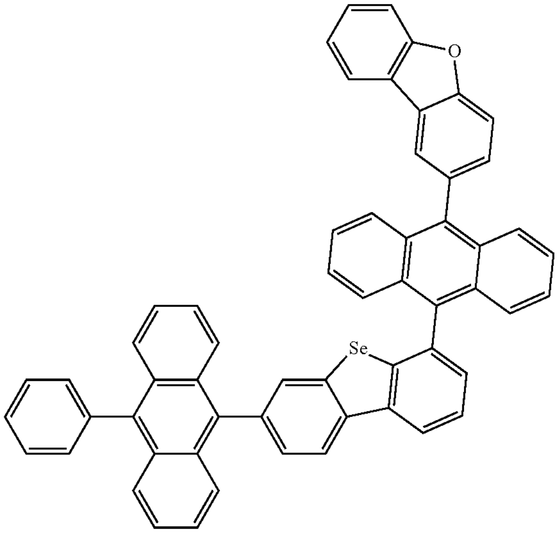
-continued
1095
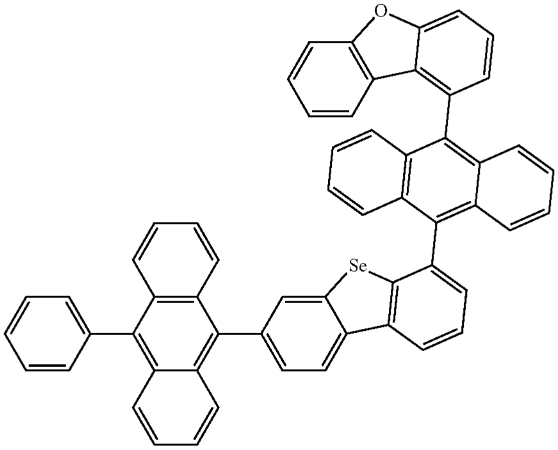
1096
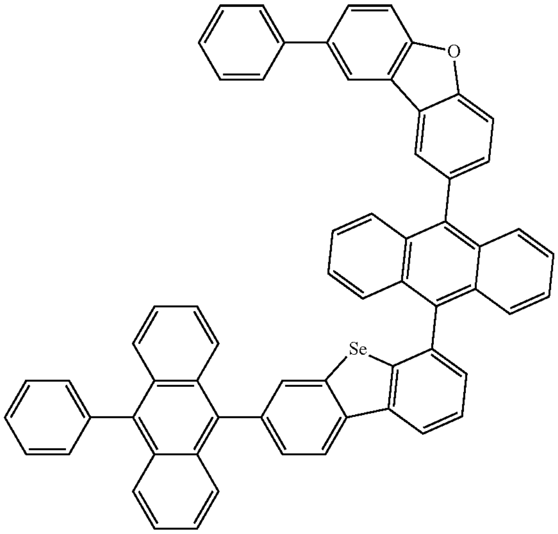
1097
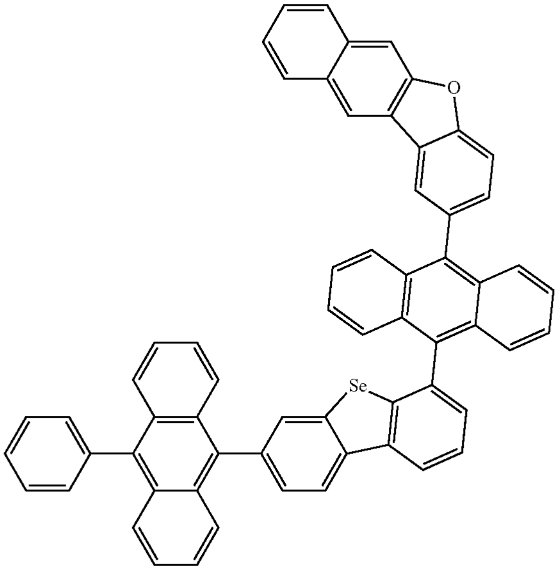

-continued
1098
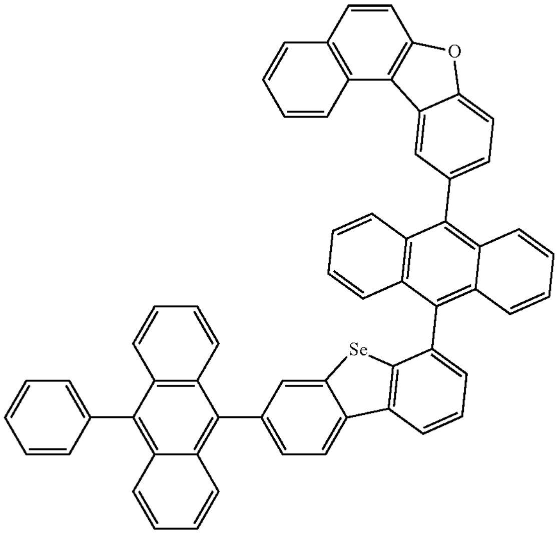
1099
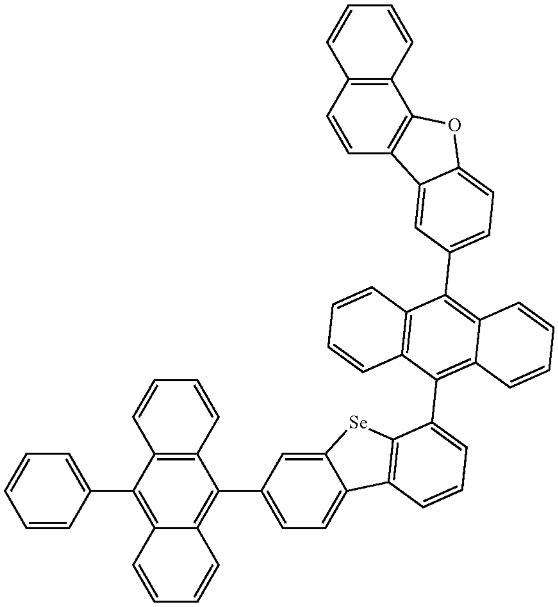
1100
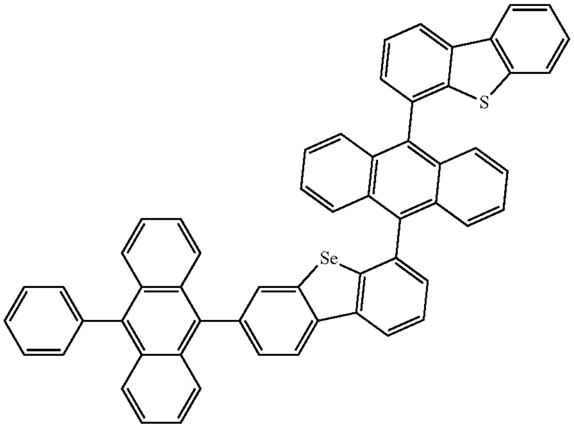
-continued
1101
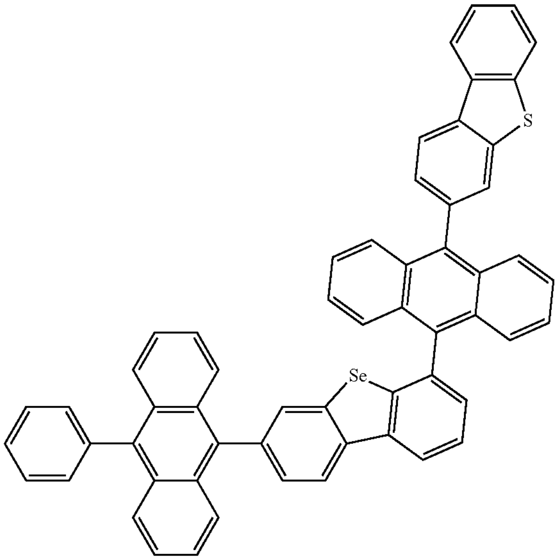
1102
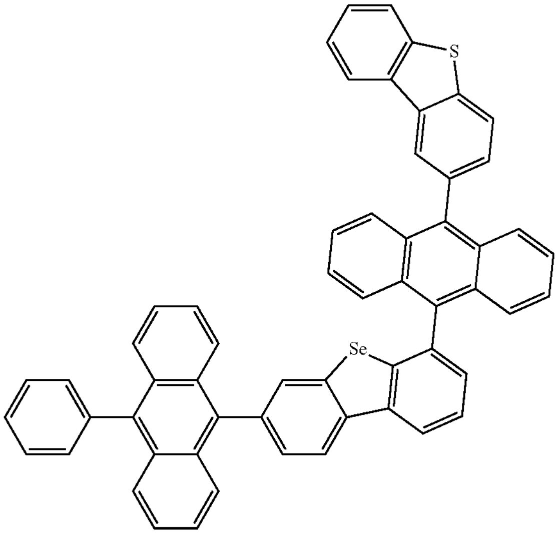
1103
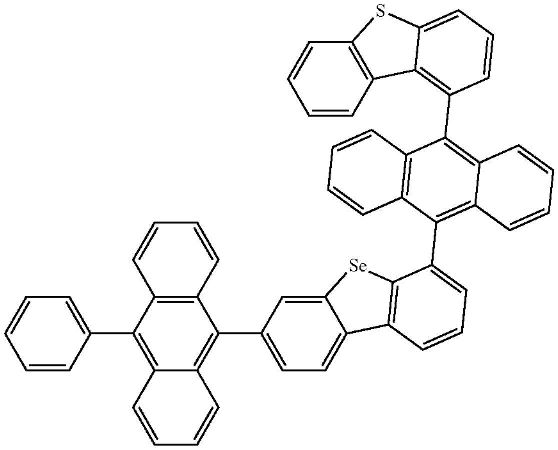

-continued
1104
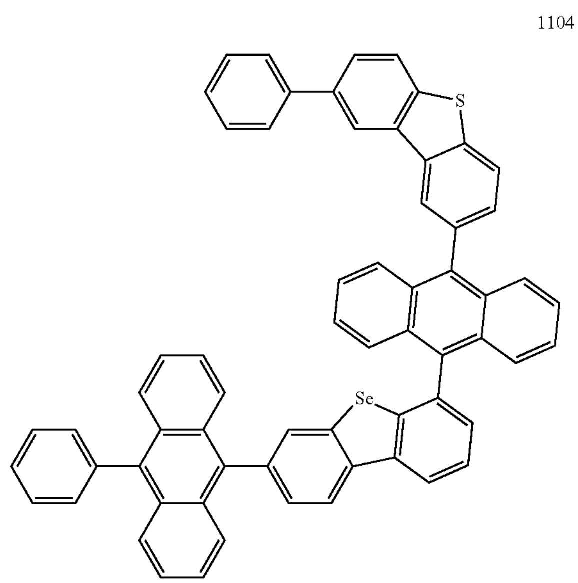
1105
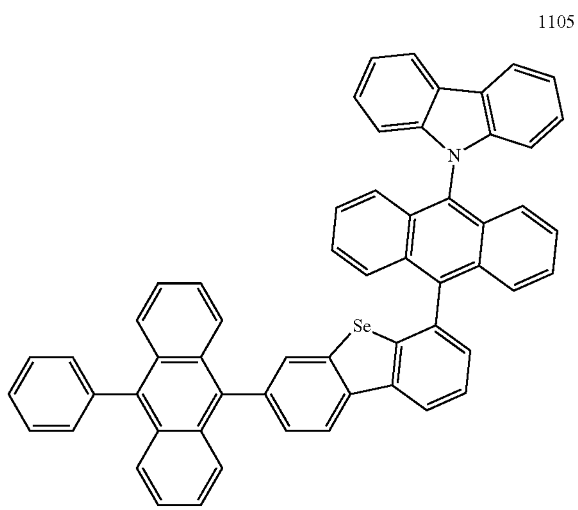
1106
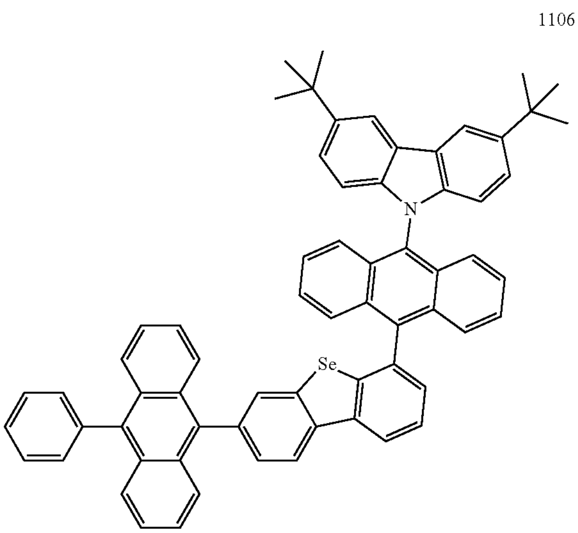
-continued
1107
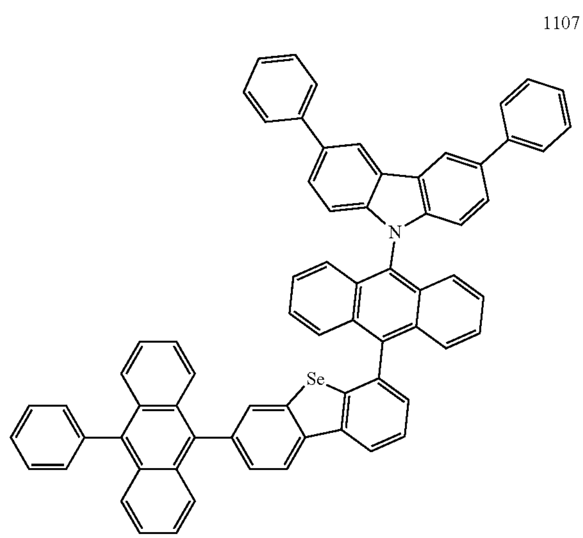
1108
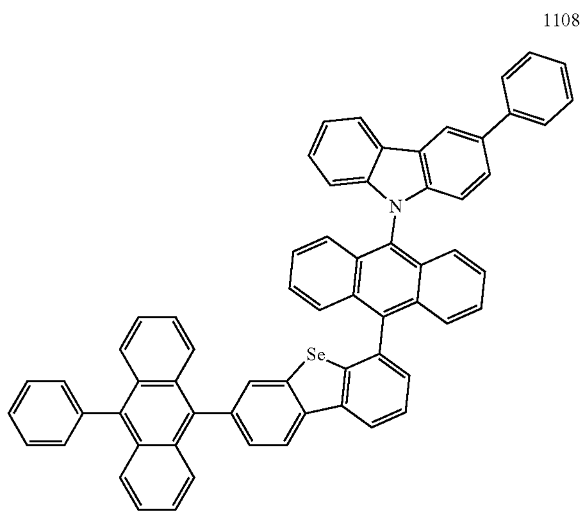
1109
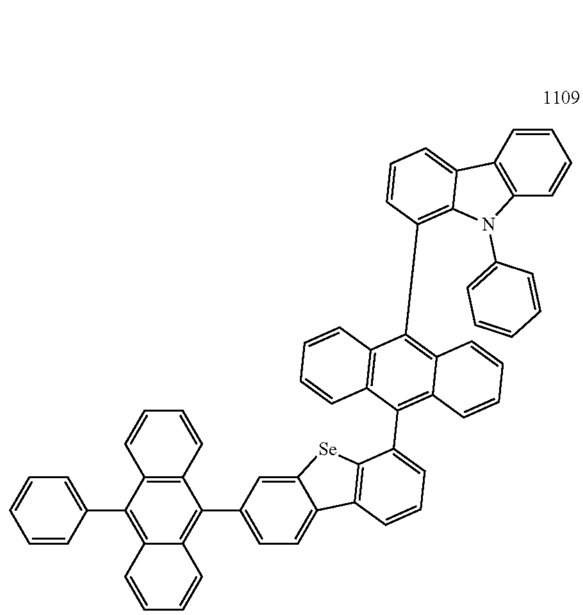

-continued
1110
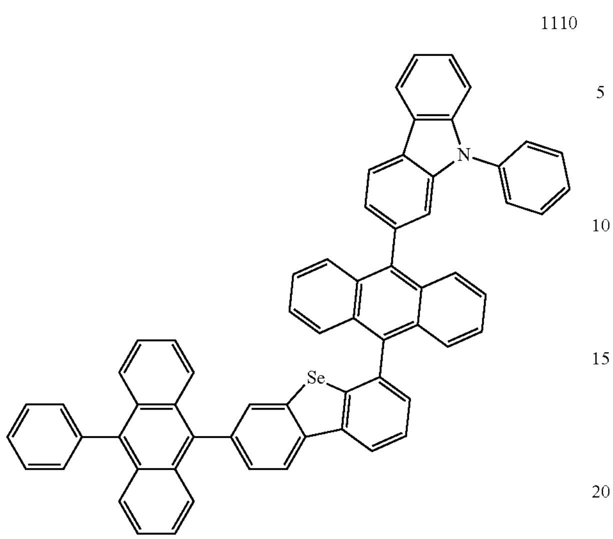
1111
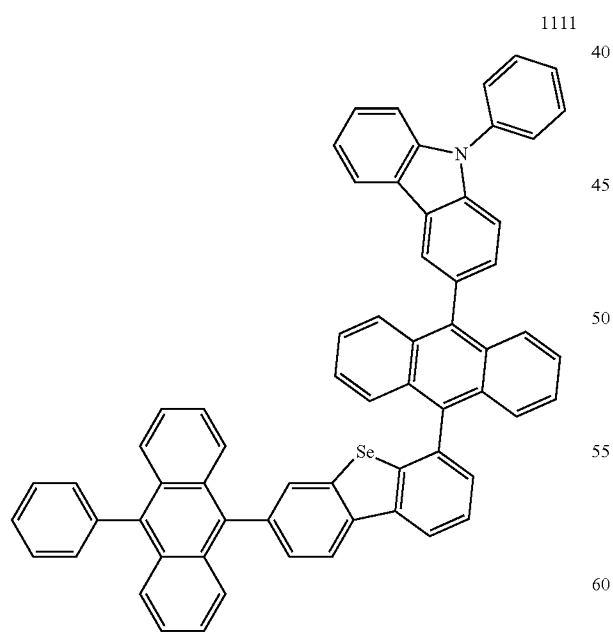
-continued
1112
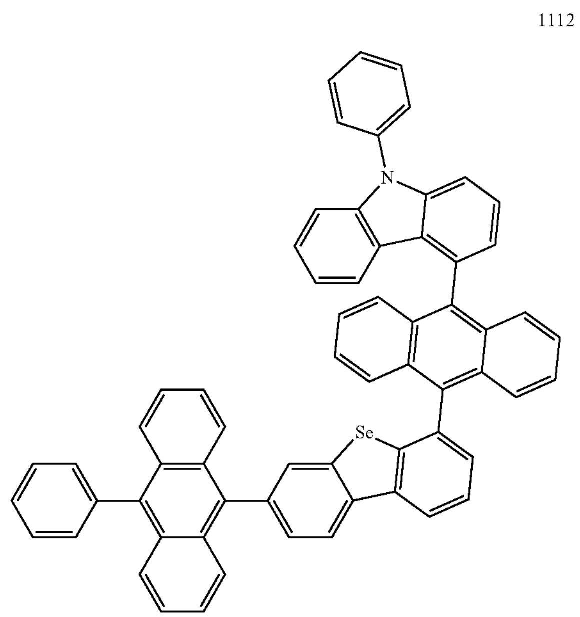
1113
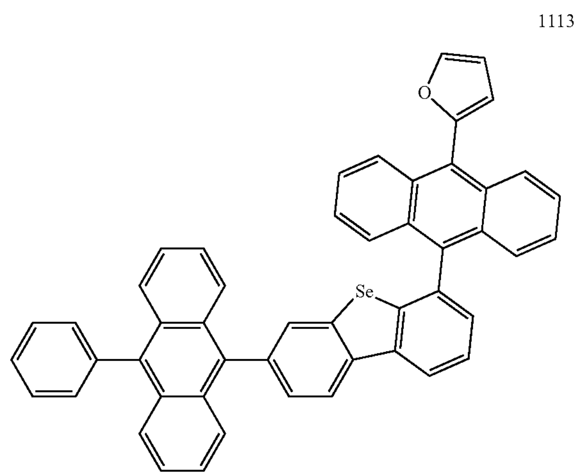
1114
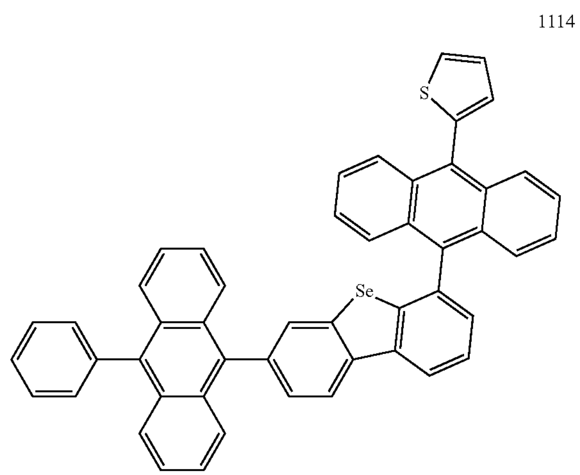

-continued
1115
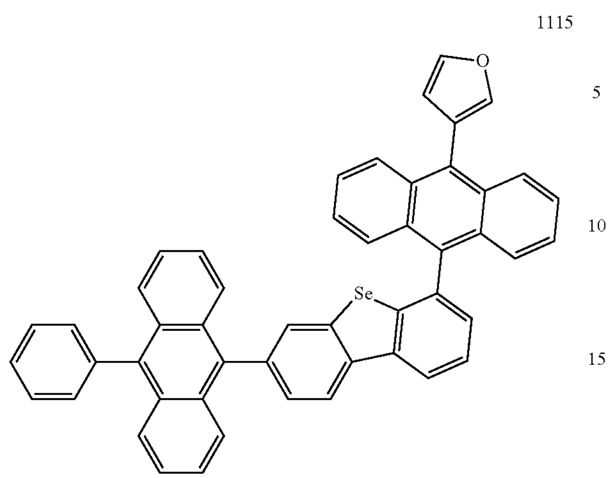
1116
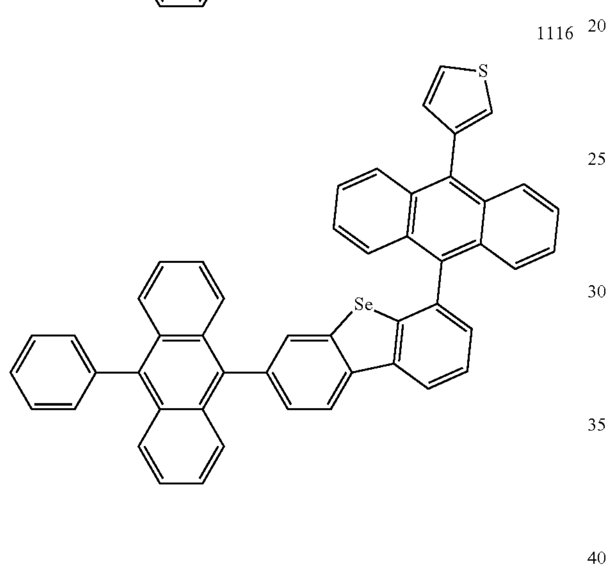
1117
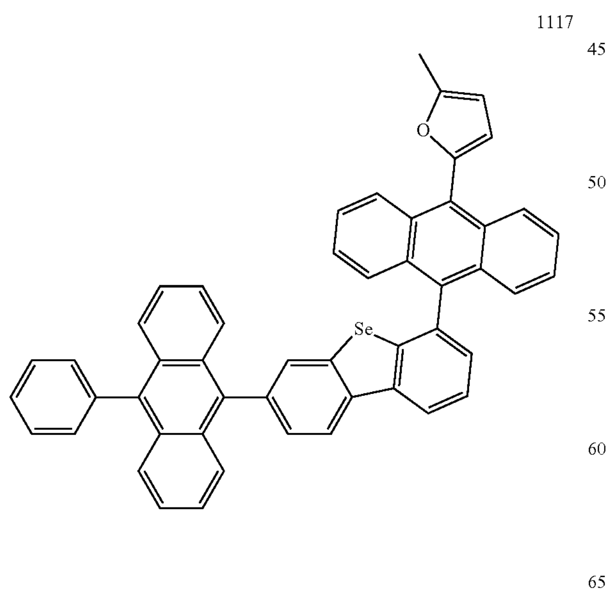
-continued
1118
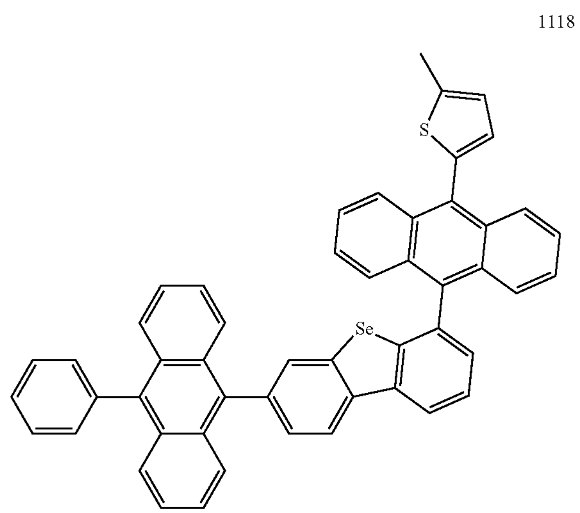
1119
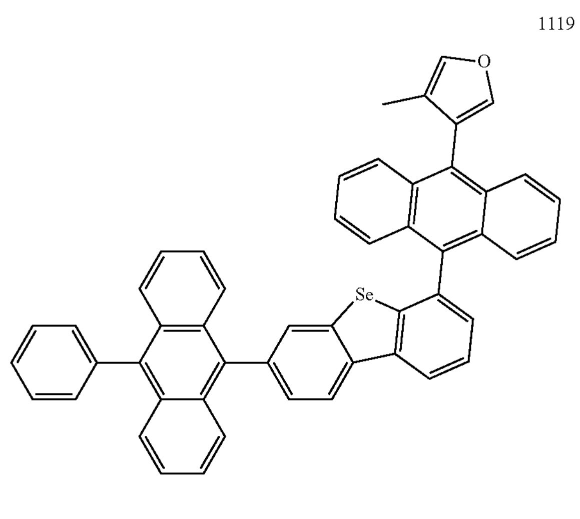
1120
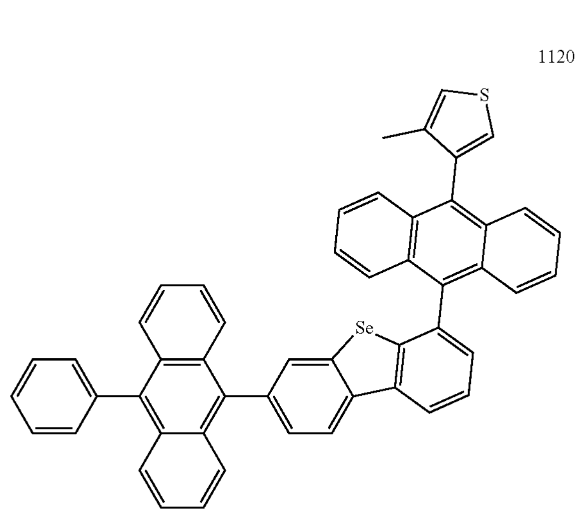

-continued
1121
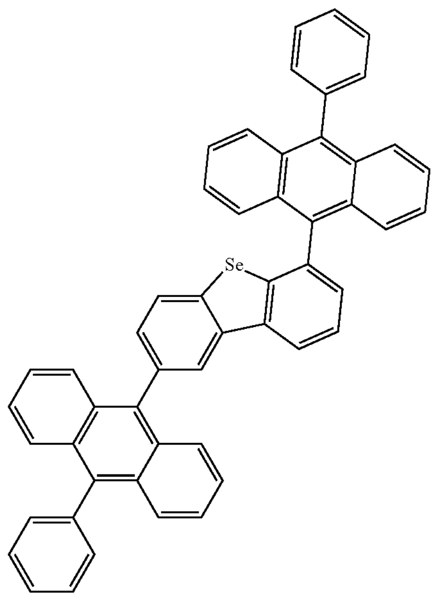
1122
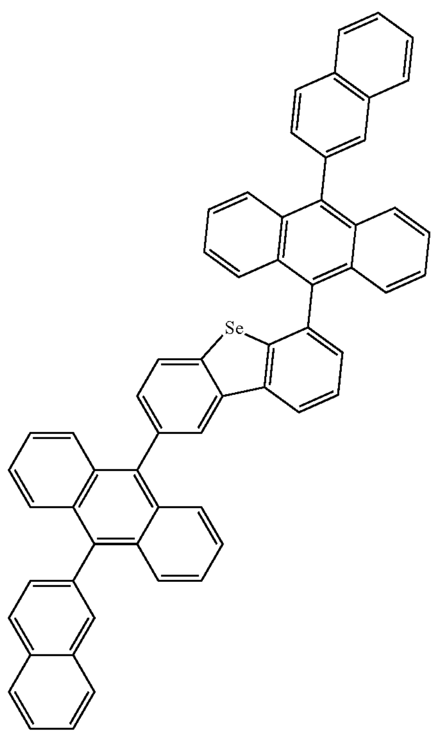
-continued
1123
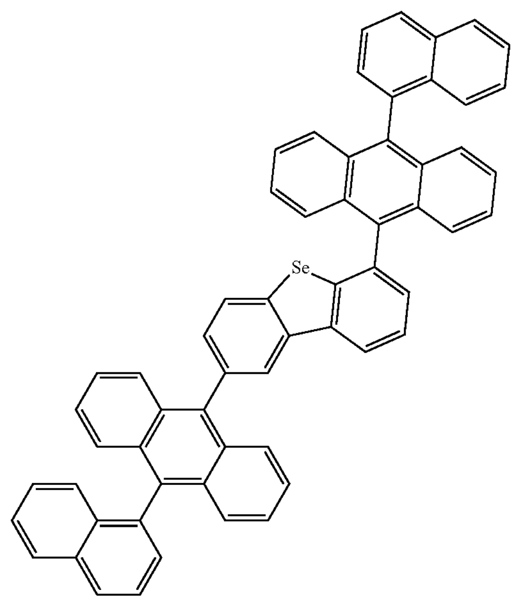
1124
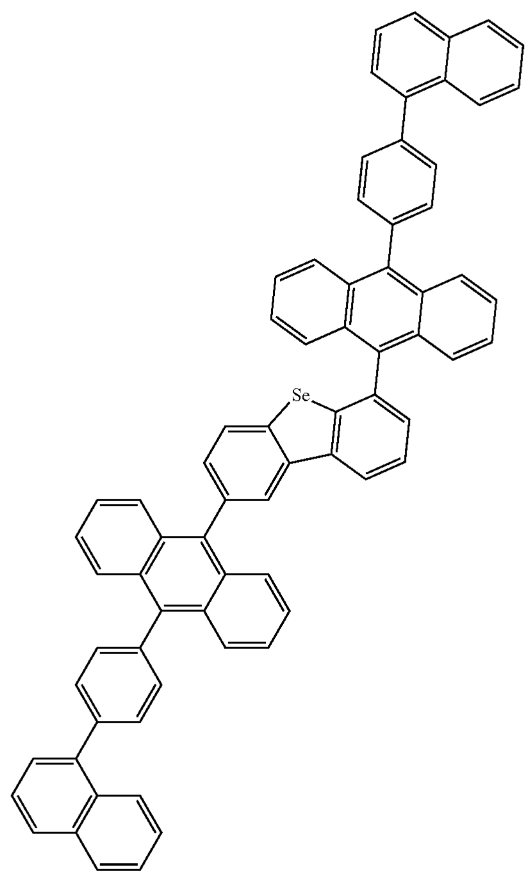

-continued
1125
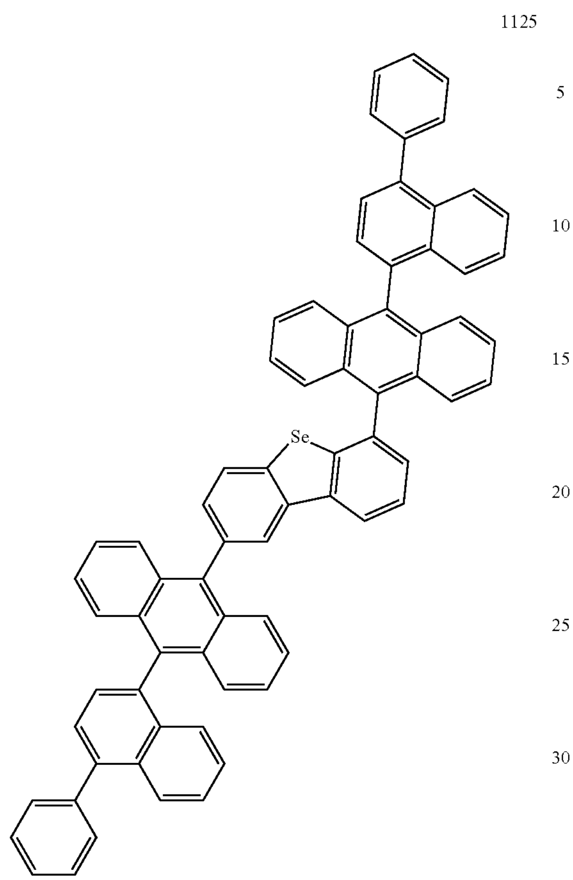
1126
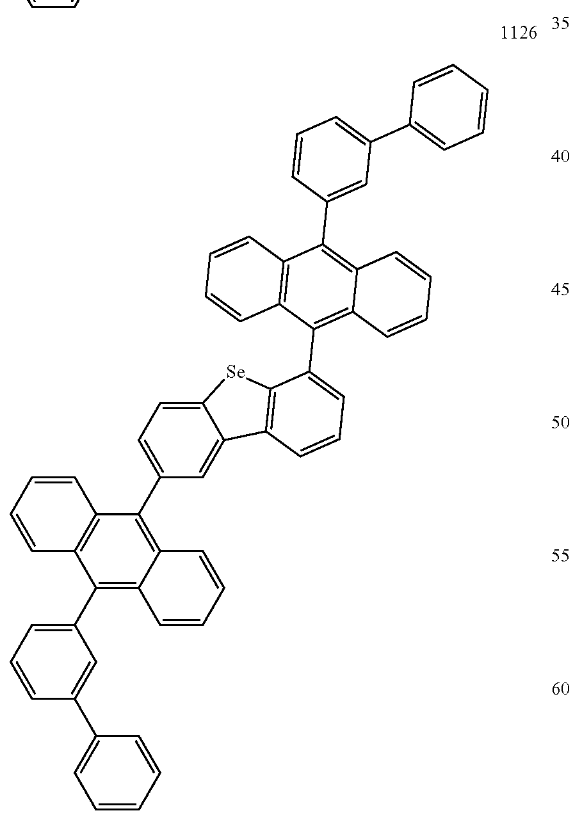
-continued
1127
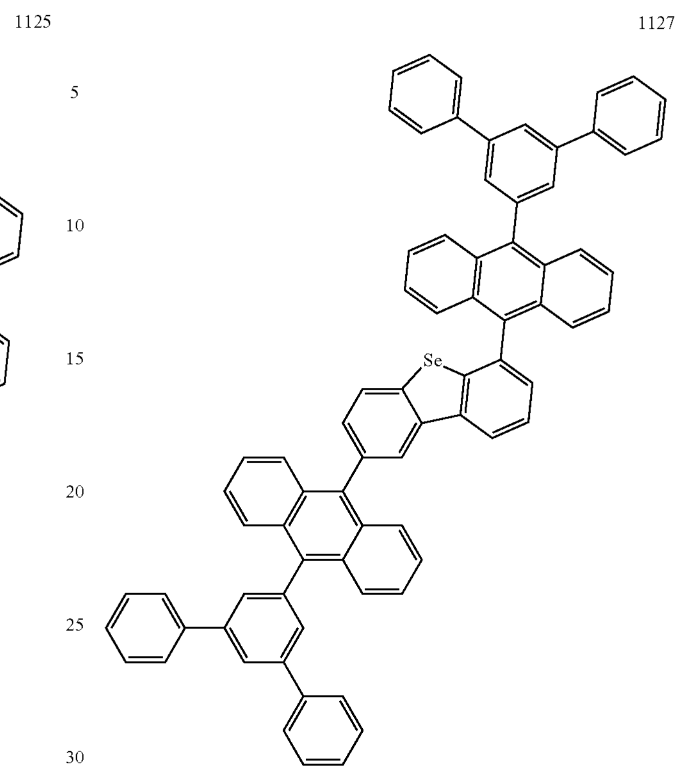
1128
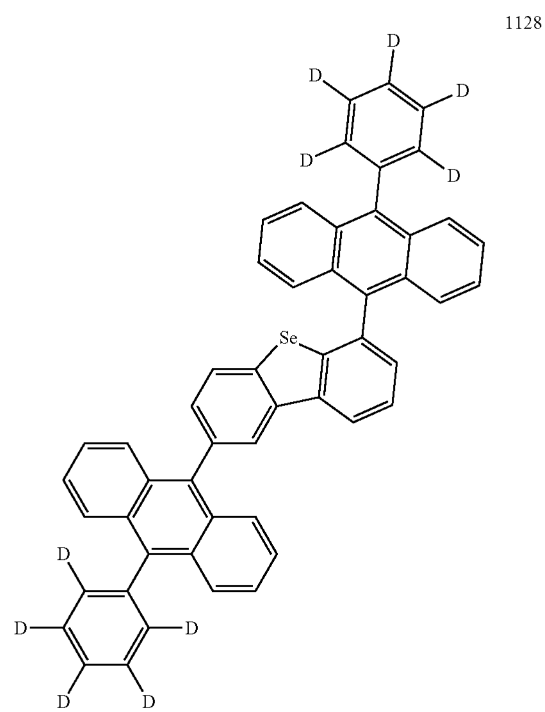

-continued
1129
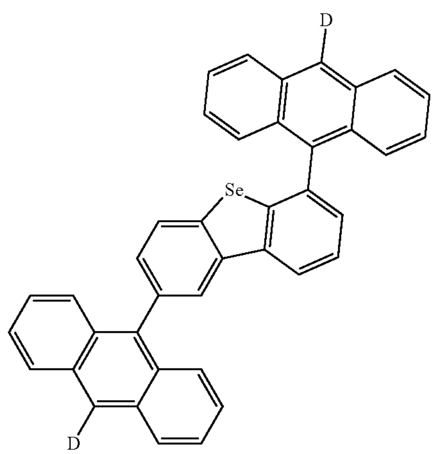
1132
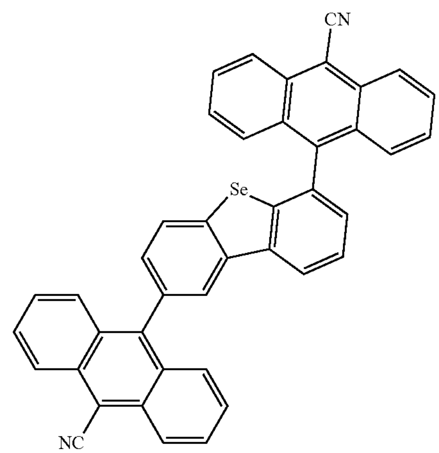
1130
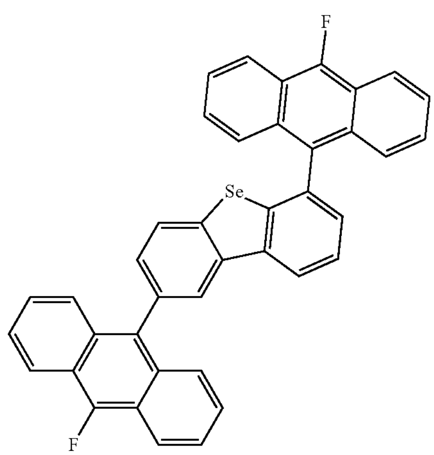
1133
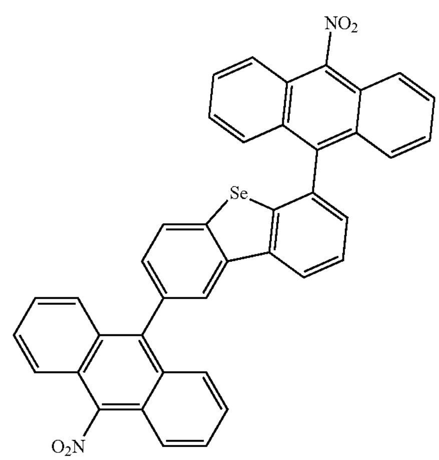
1131
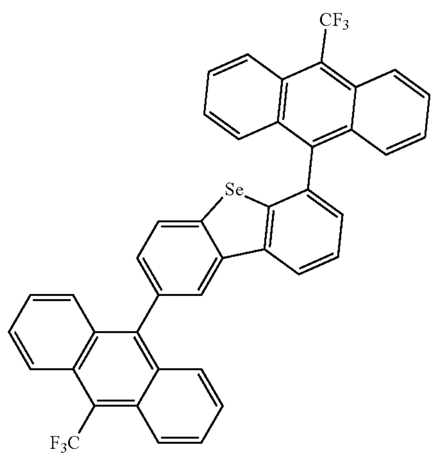
1134
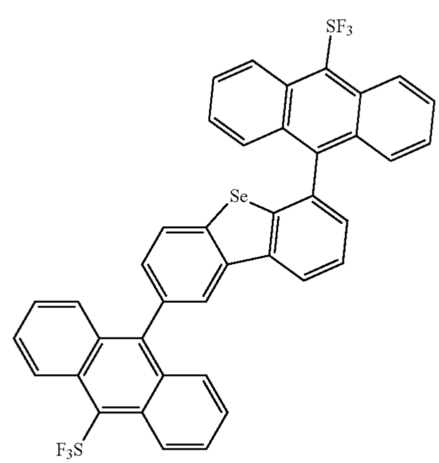

-continued
1135
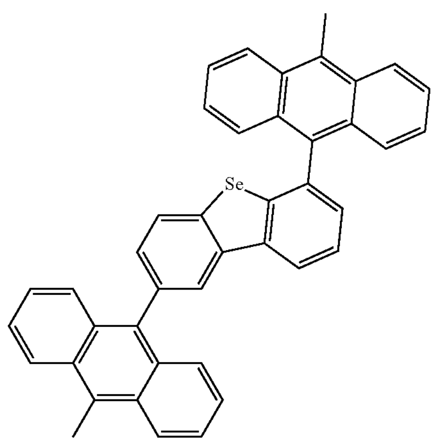
1136
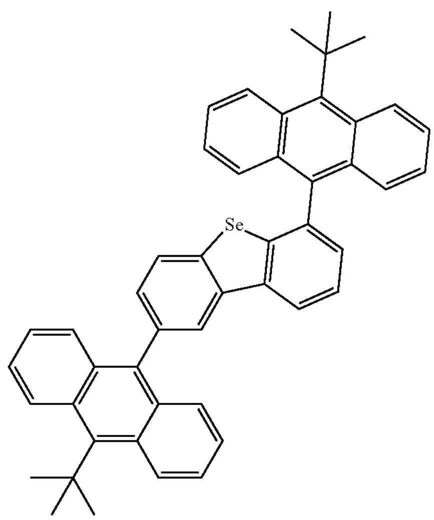
1137
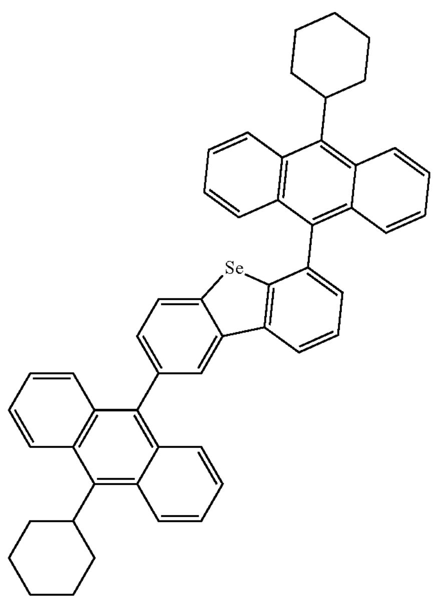
-continued
1138
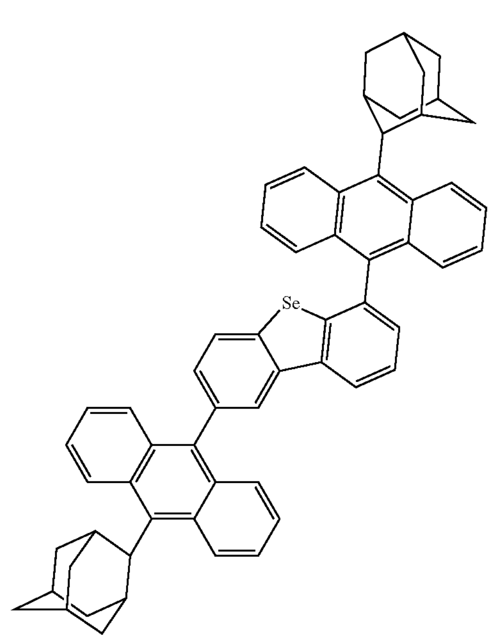
1139
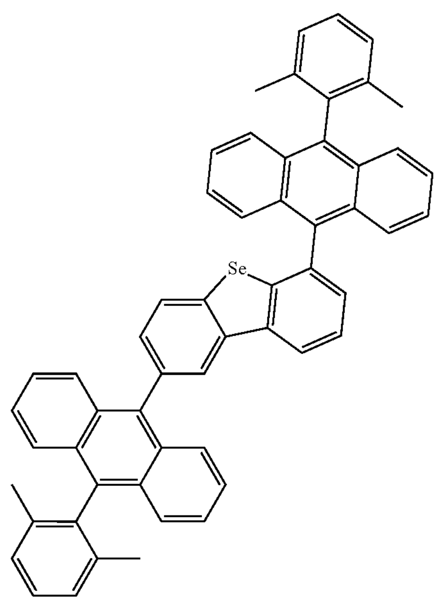

1140
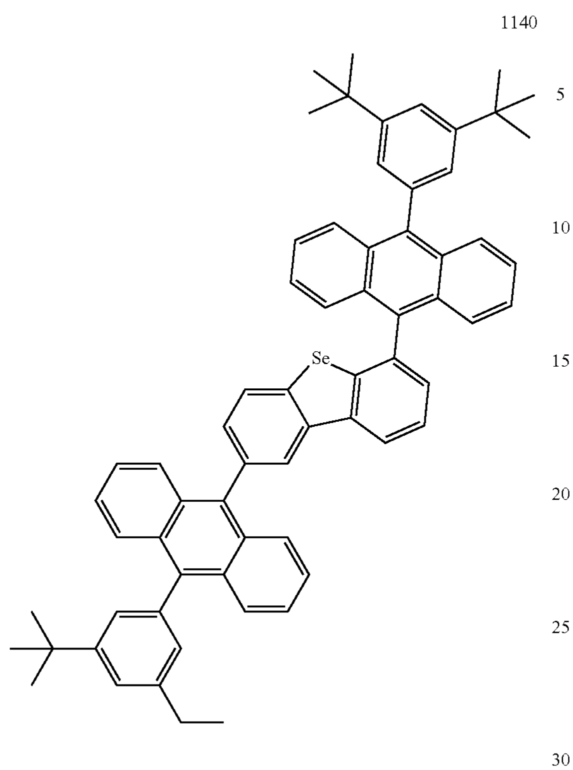
1141
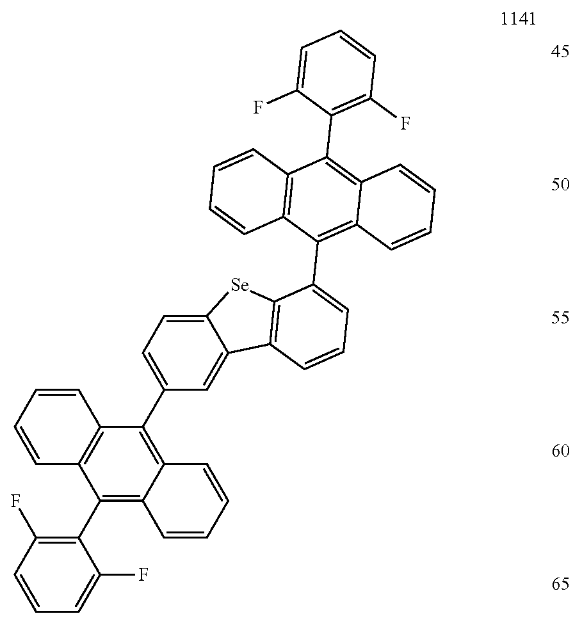
1142
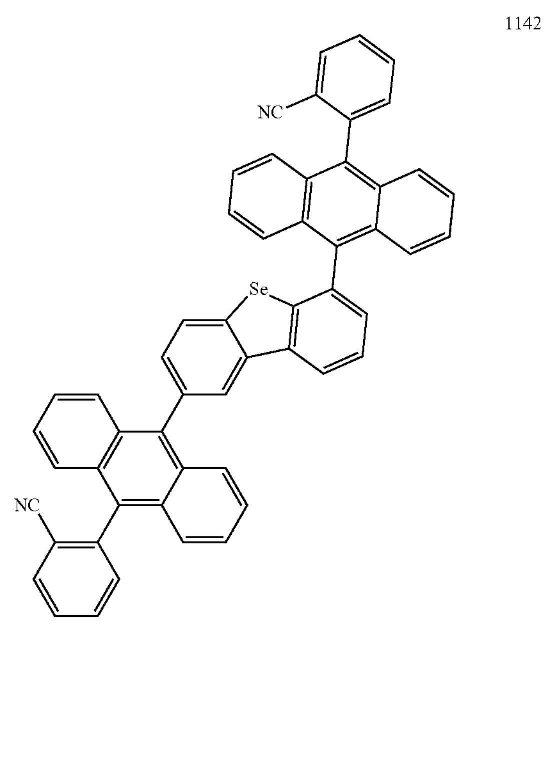
1143
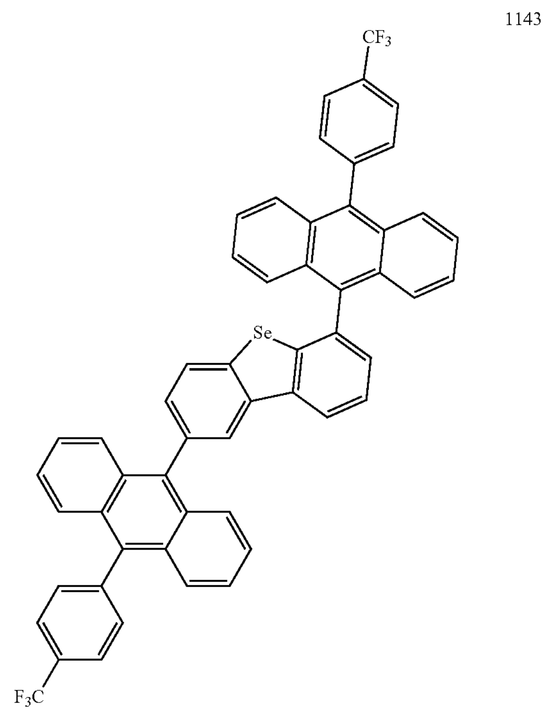

-continued
1144
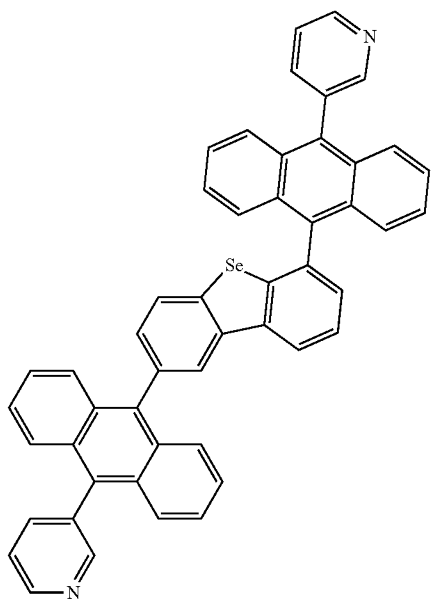
1145
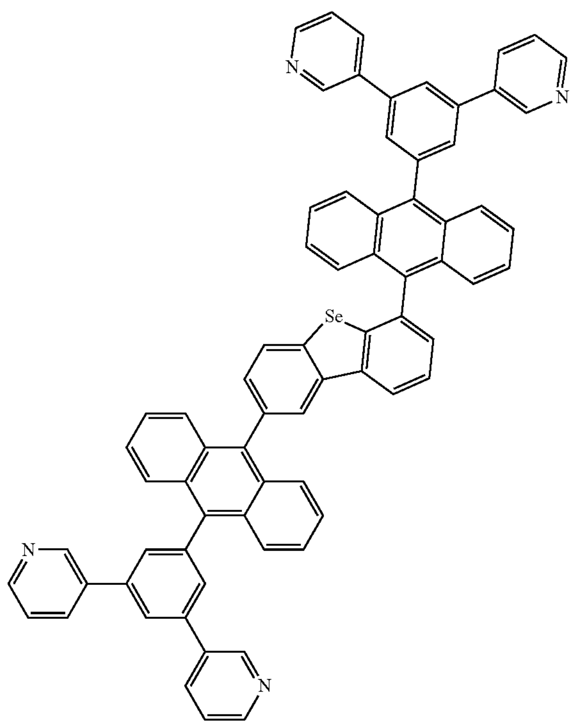
-continued
1146
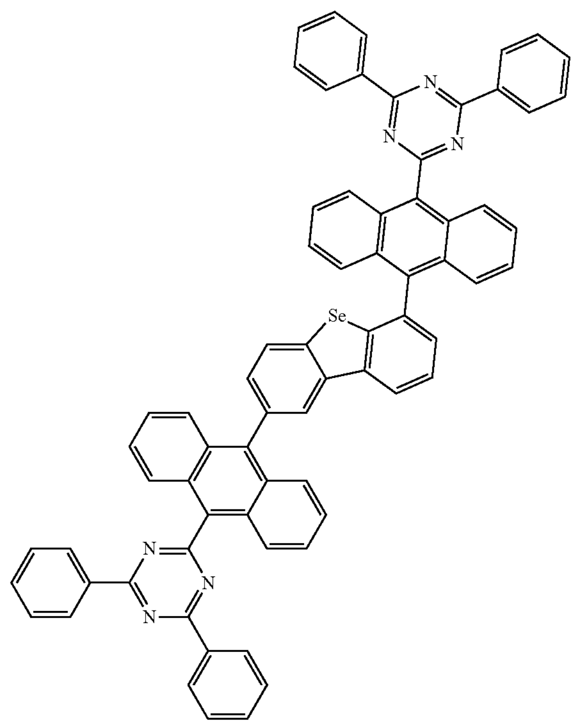
1147
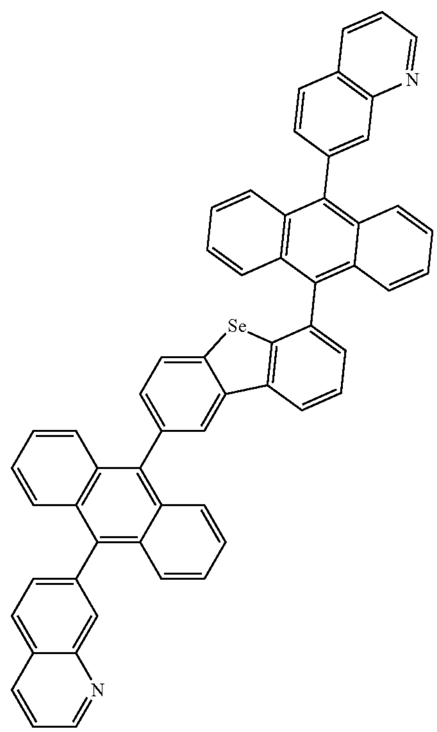

-continued
1148
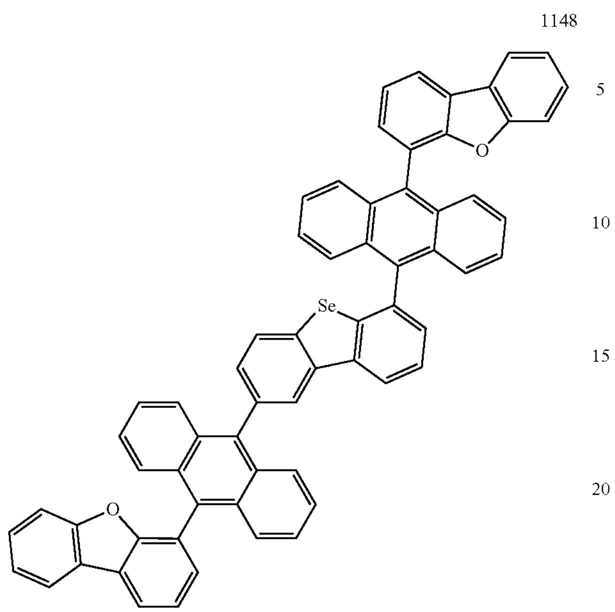
1149
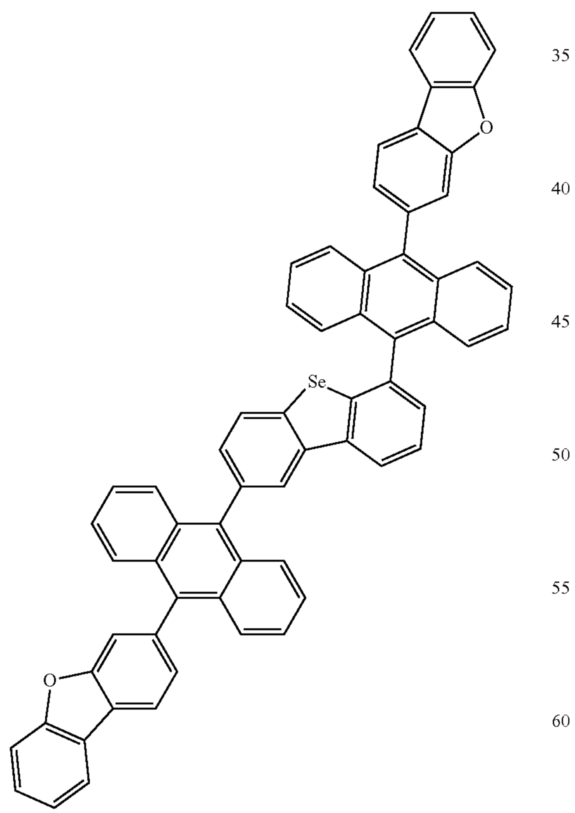
-continued
1150
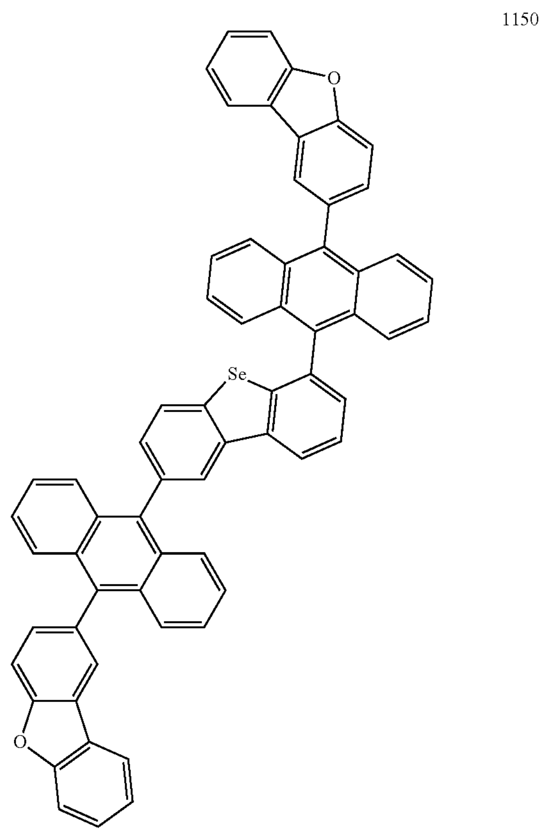
1151
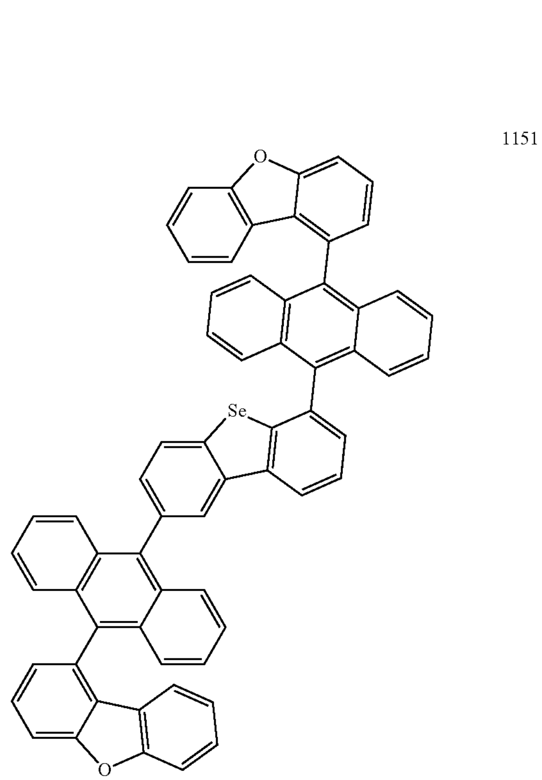

-continued
1152
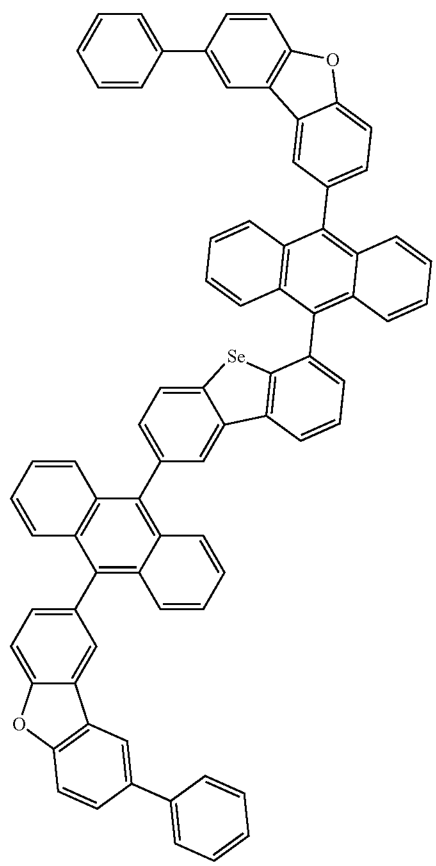
-continued
1153
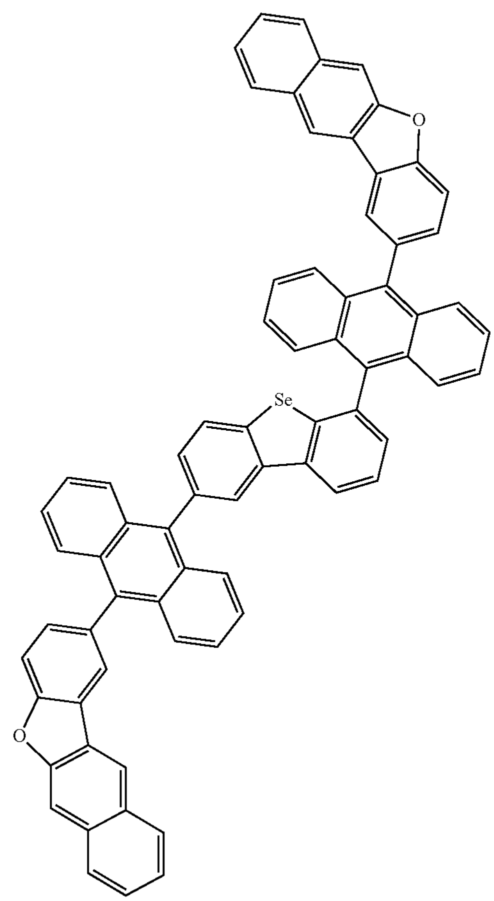

-continued
1154
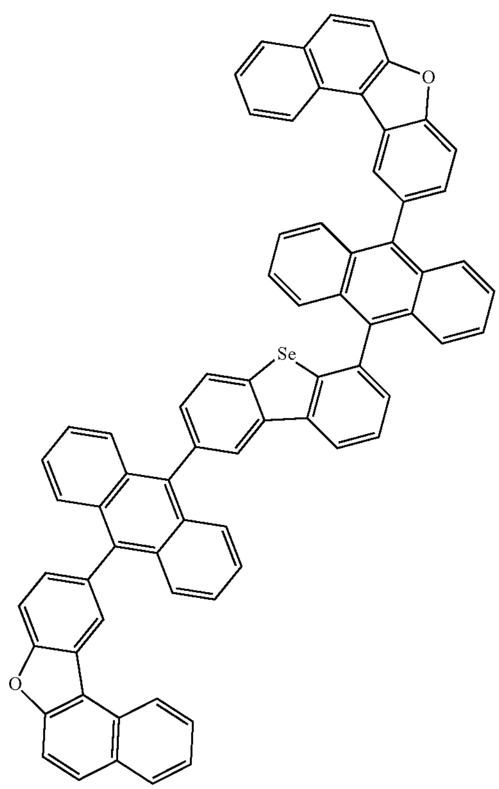
1155
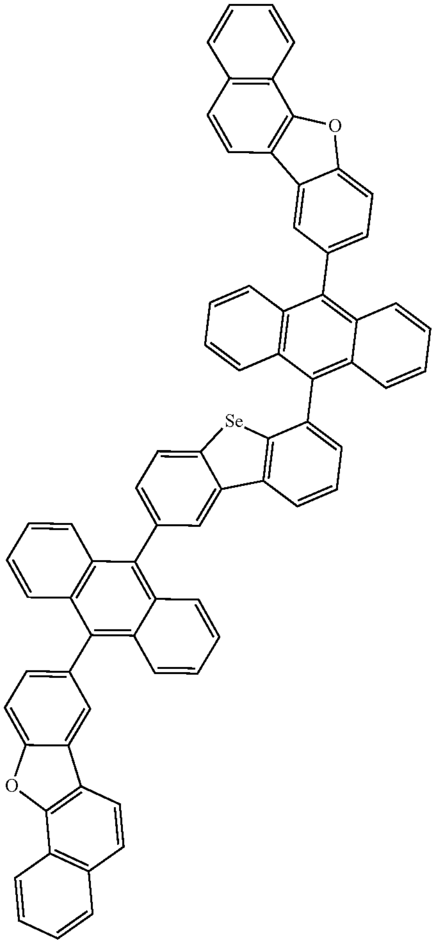
1156
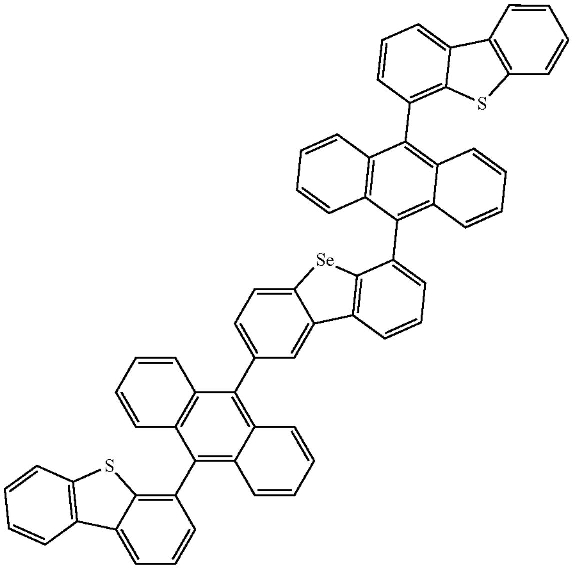

-continued
1157
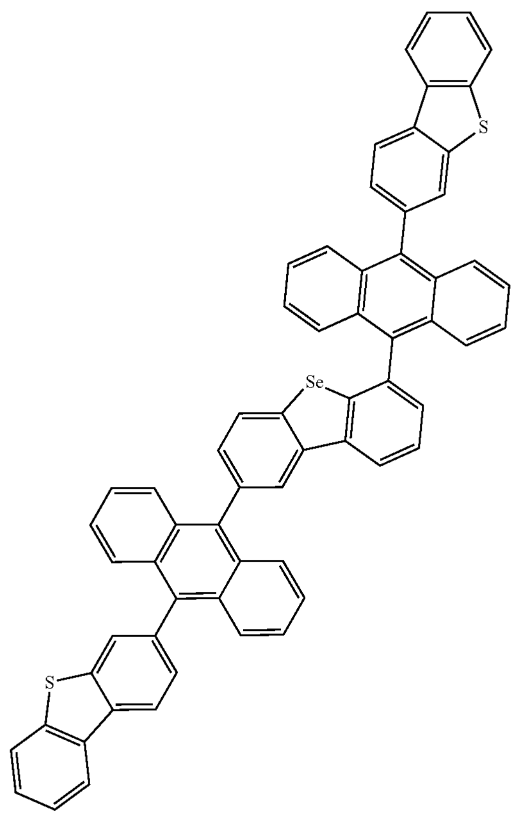
1158
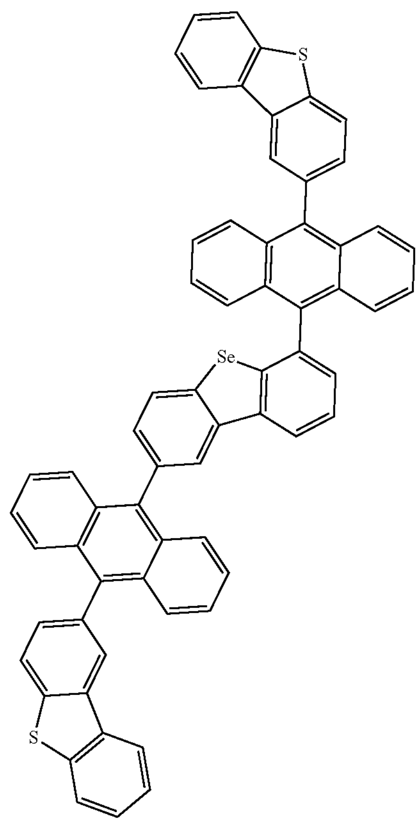
-continued
1159
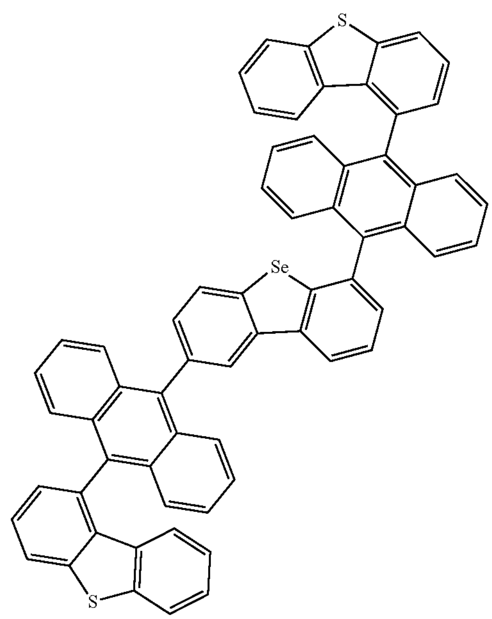
1160
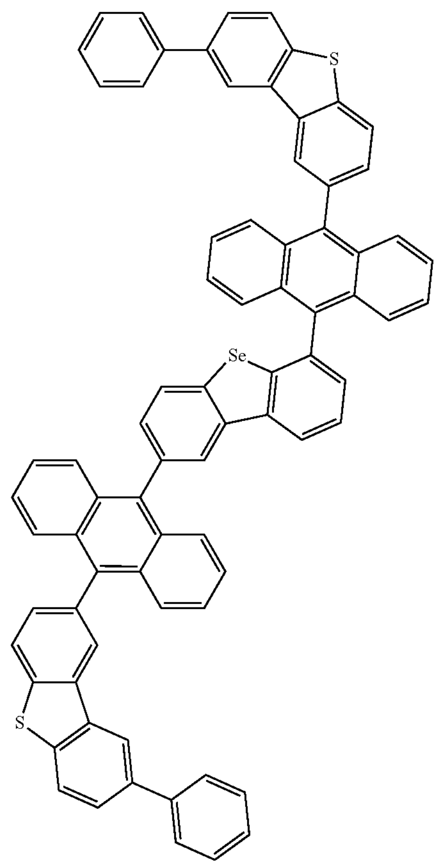

-continued
1161
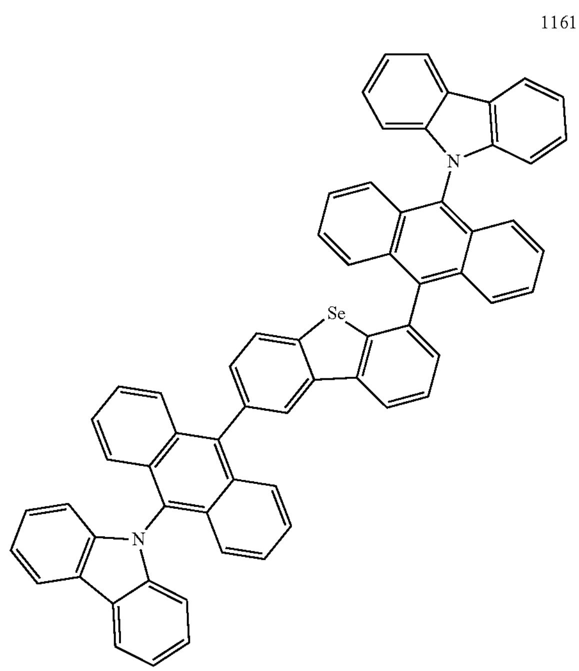
1162
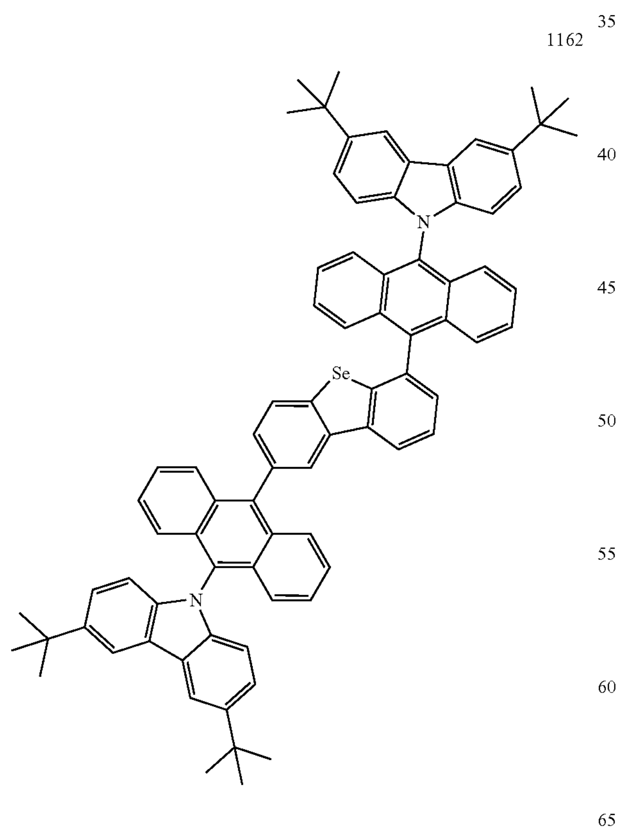
-continued
1163
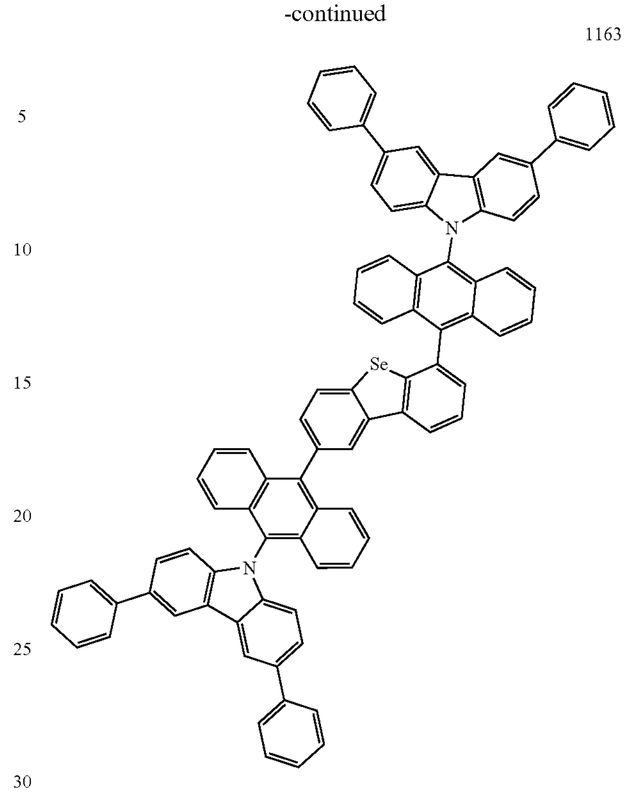
1164
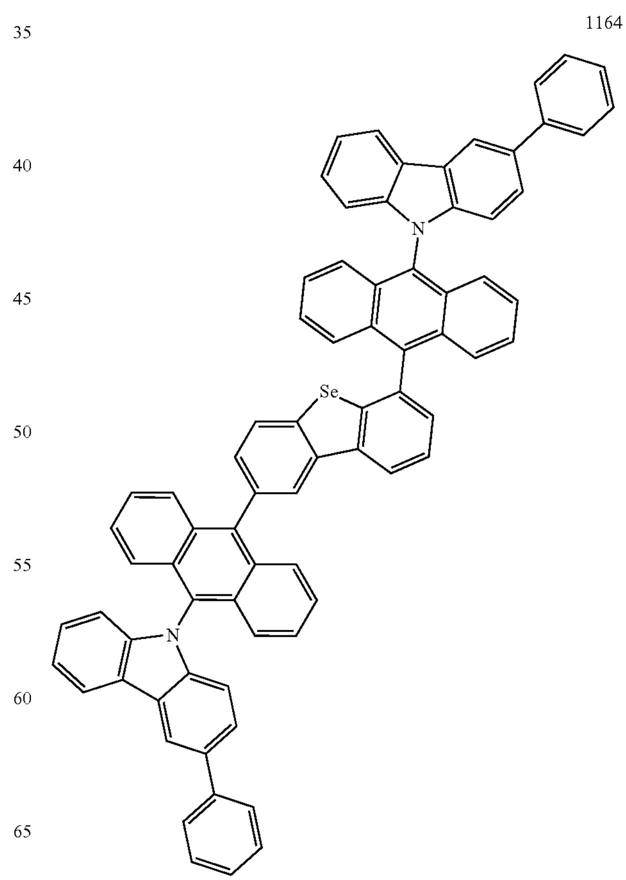

-continued
1165
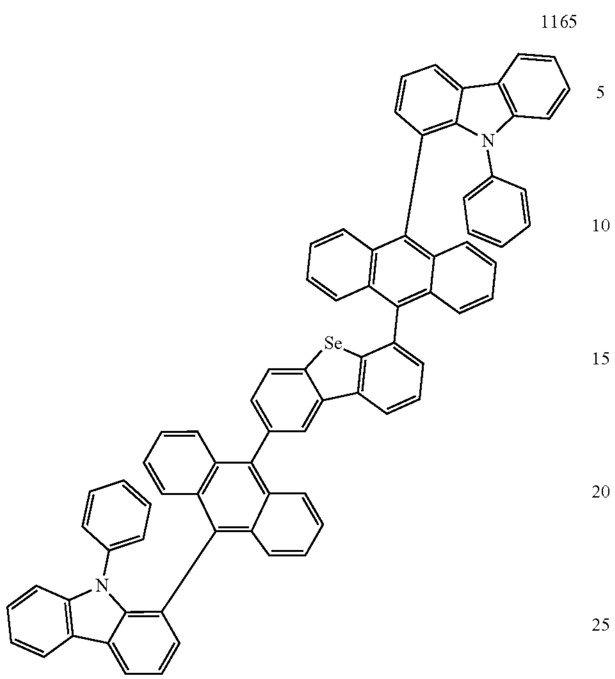
1166
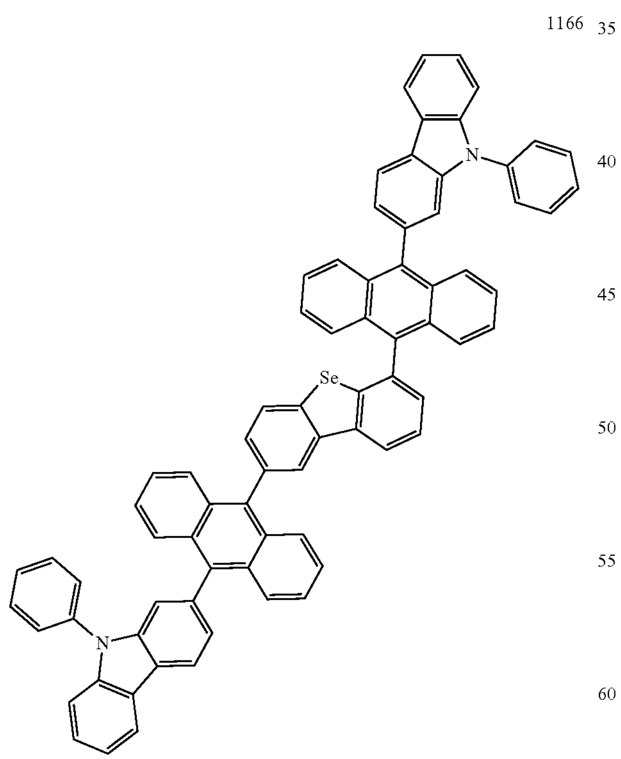
-continued
1167
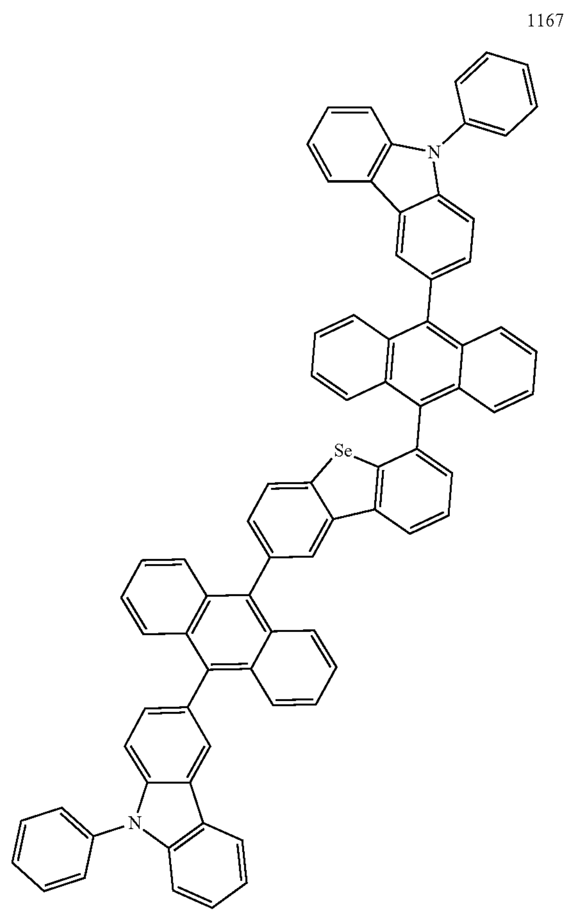

-continued
1168
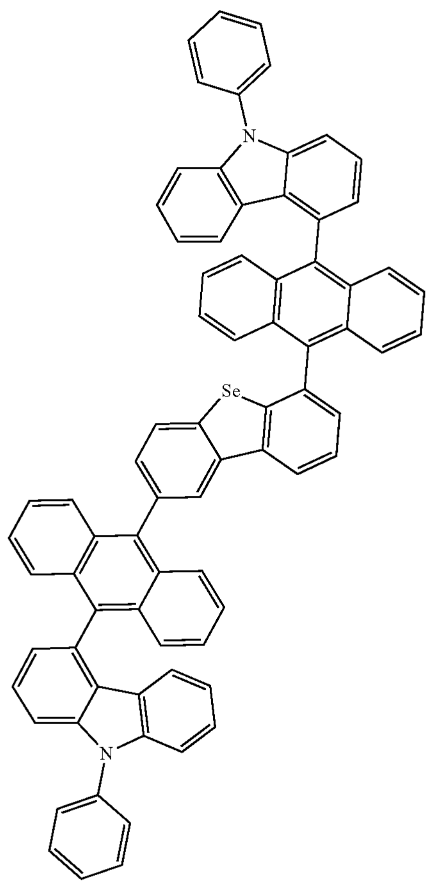
1169
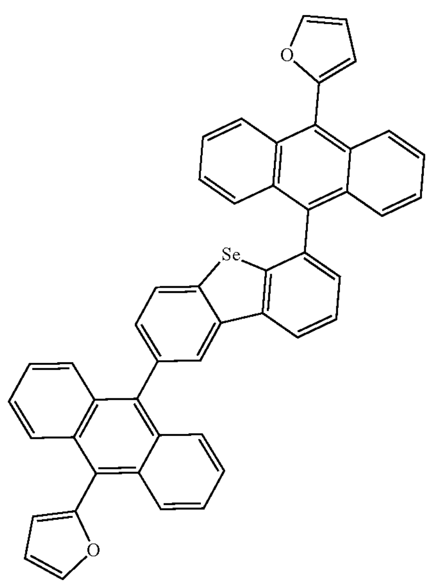
-continued
1170
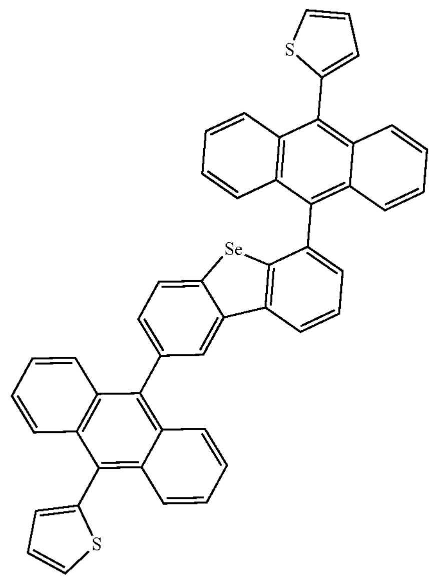
1171
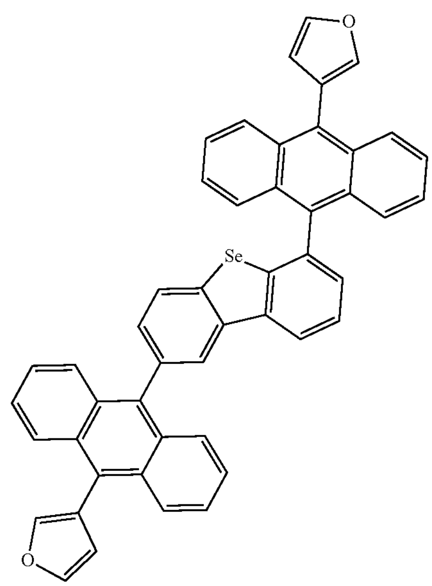

-continued
1172
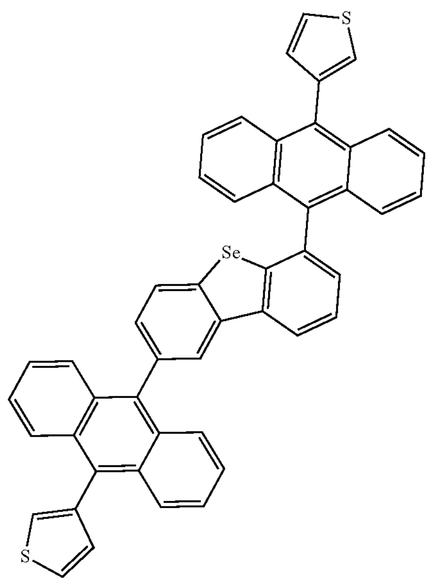
1173
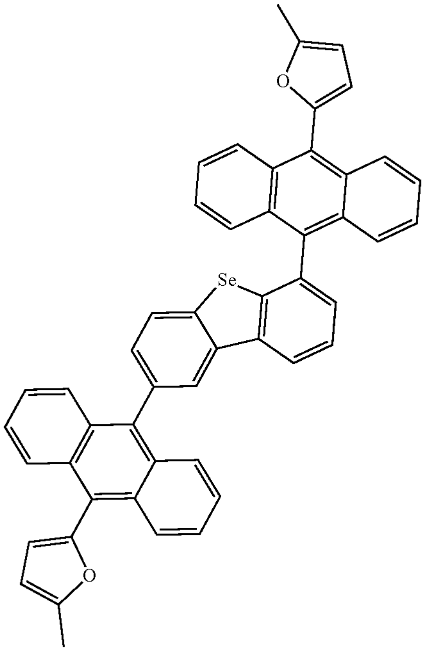
-continued
1174
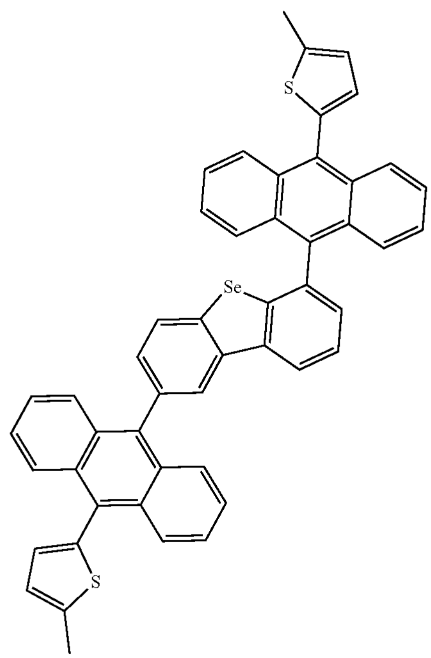
1175
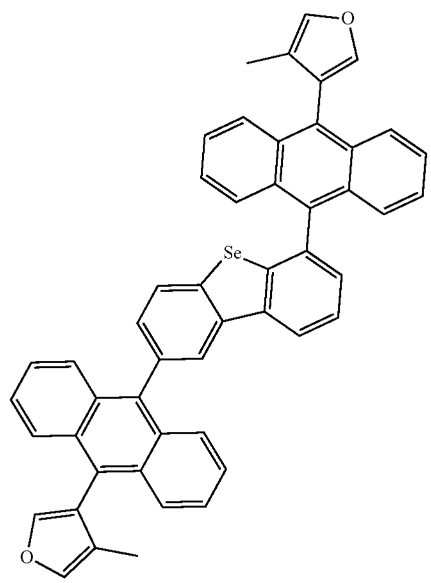

-continued
1176
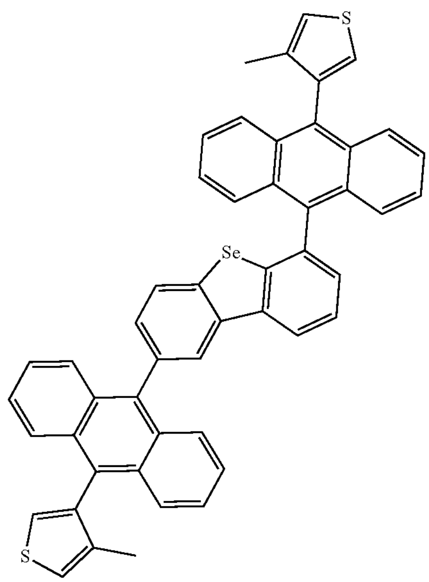
1177
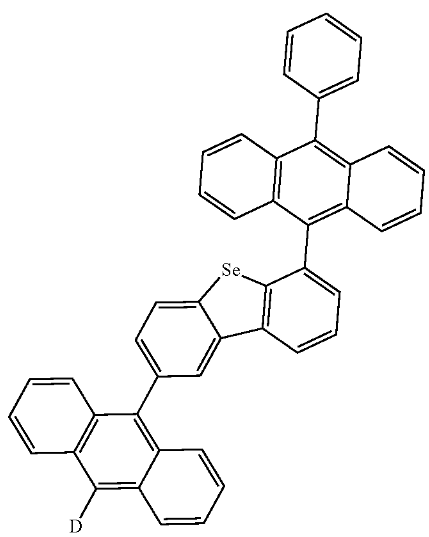
-continued
1178
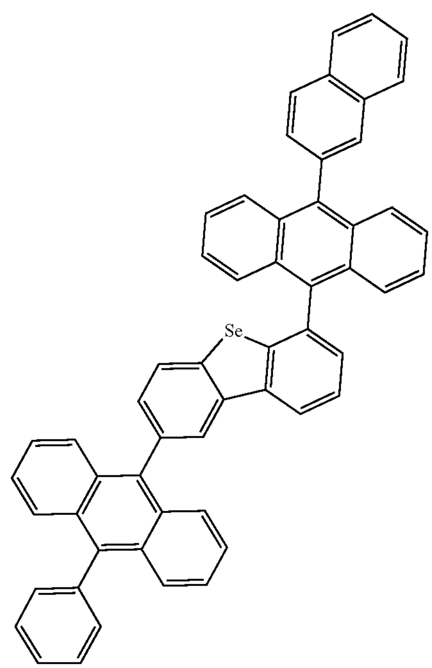
1179
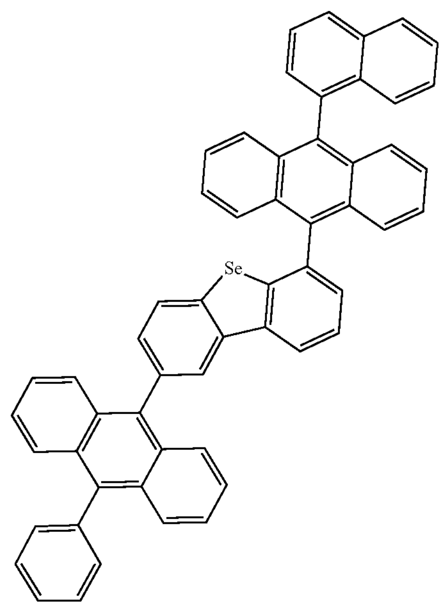

-continued
1180
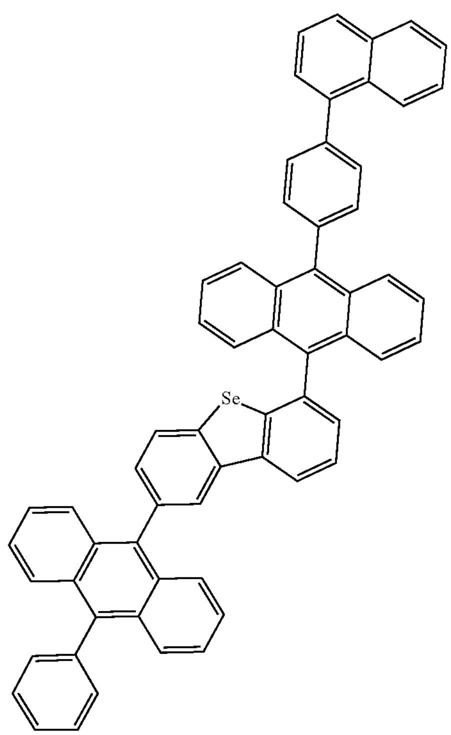
1181
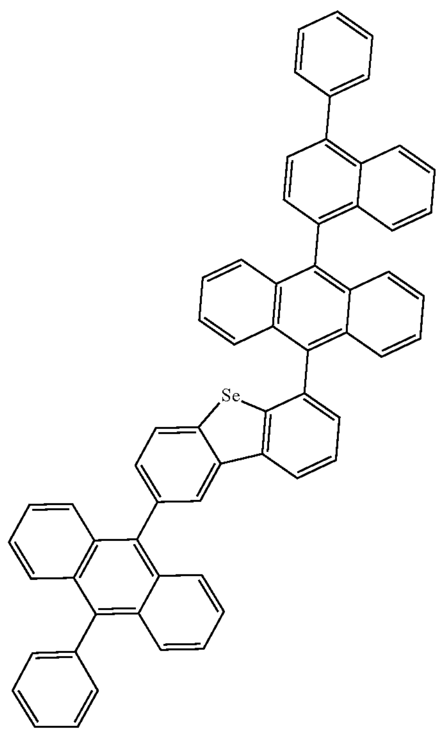
-continued
1182
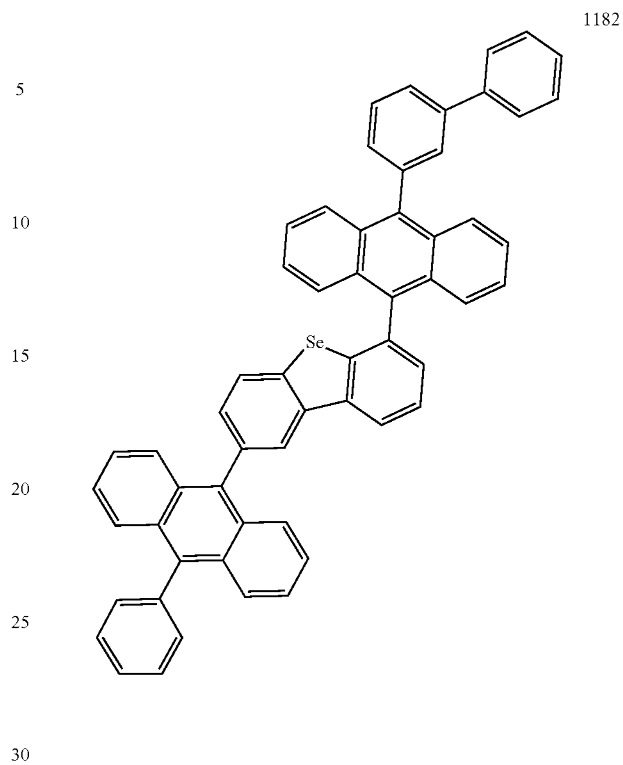
1183
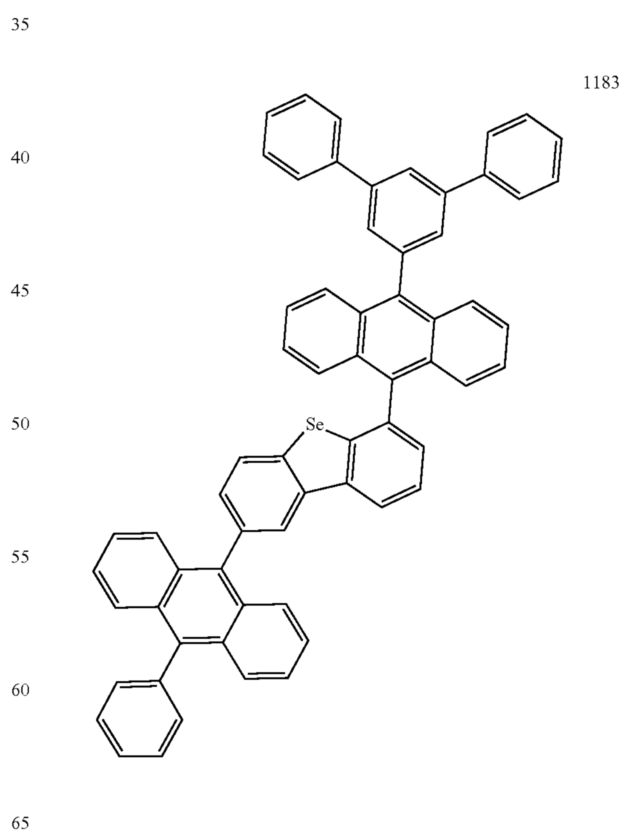

-continued
1184
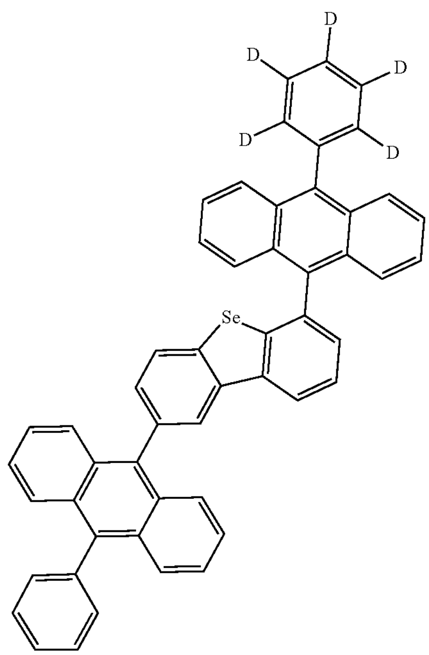
1185
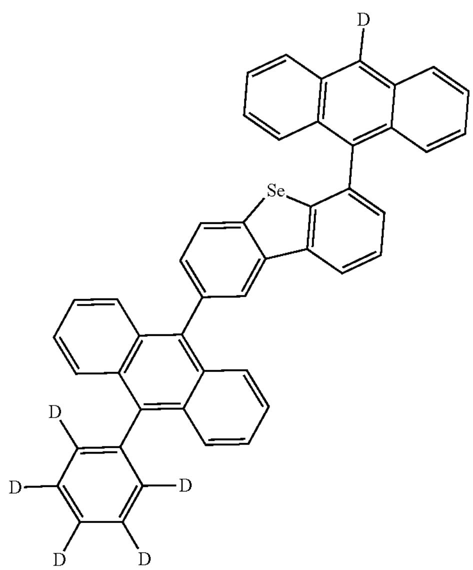
-continued
1186
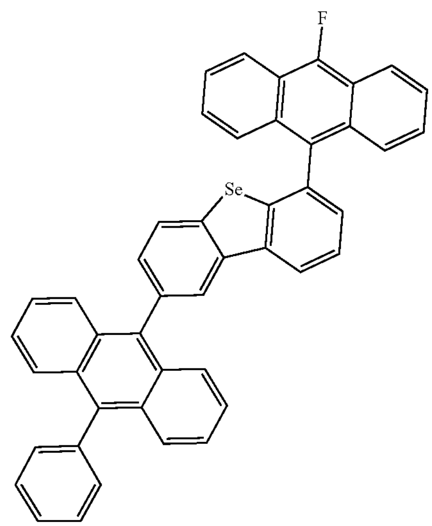
1187
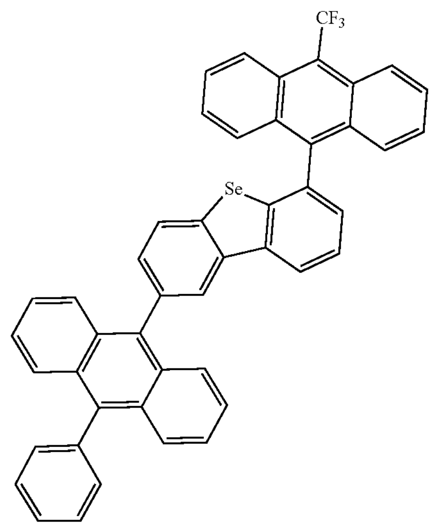
1188
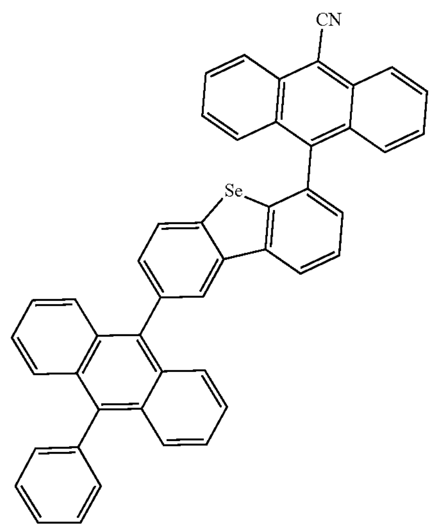

-continued
1189
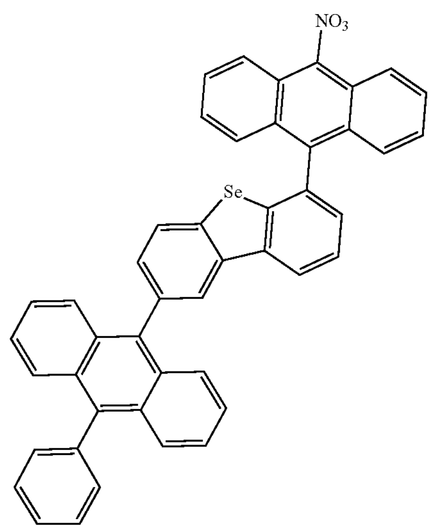
1190
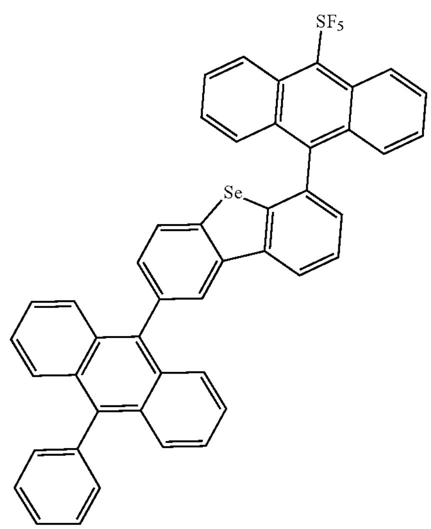
1191
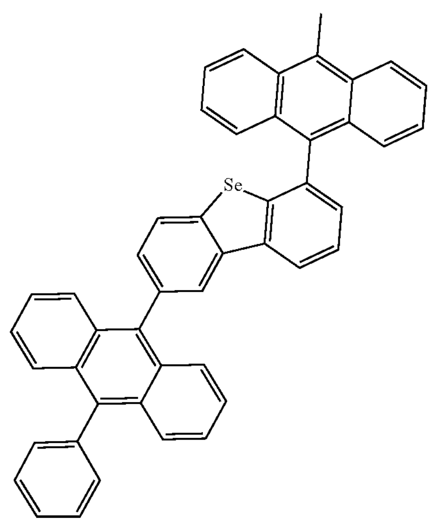
-continued
1192
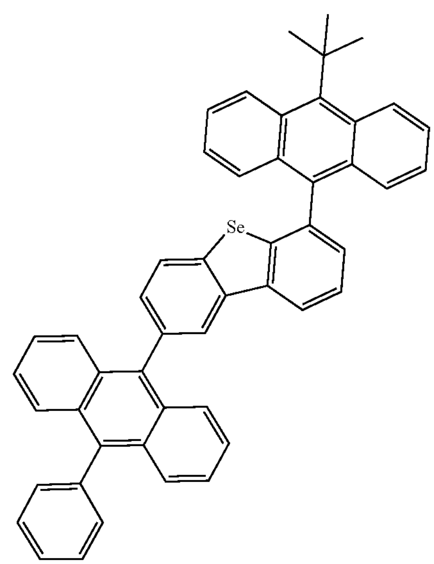
1193
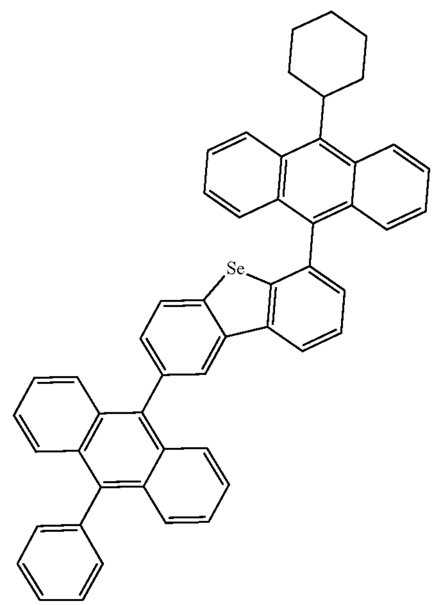

-continued
1194
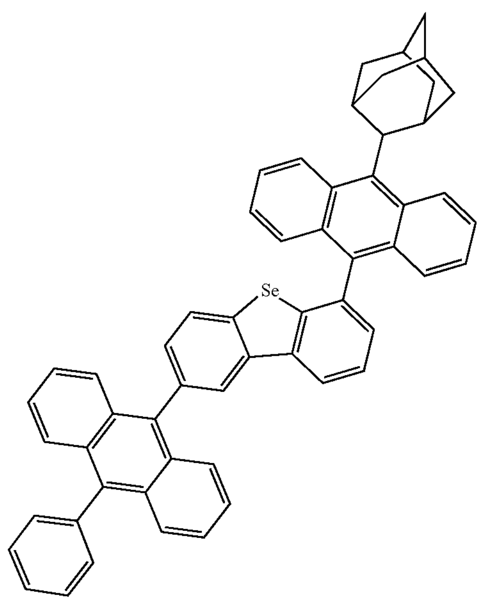
1195
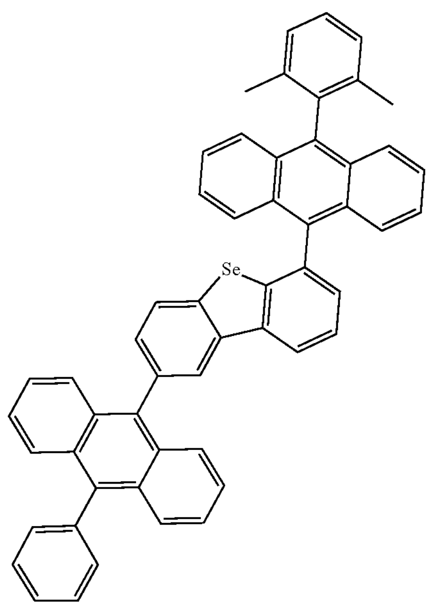
-continued
1197
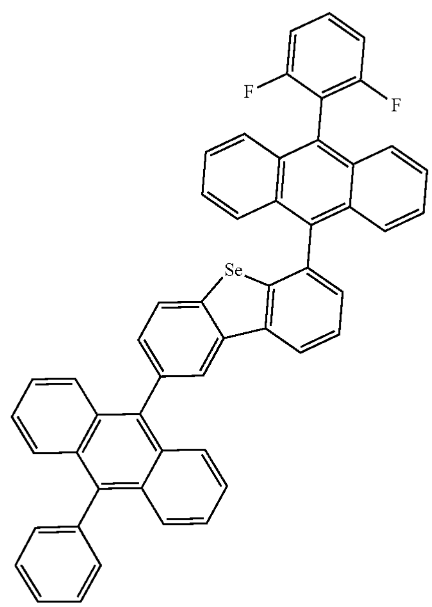
1198
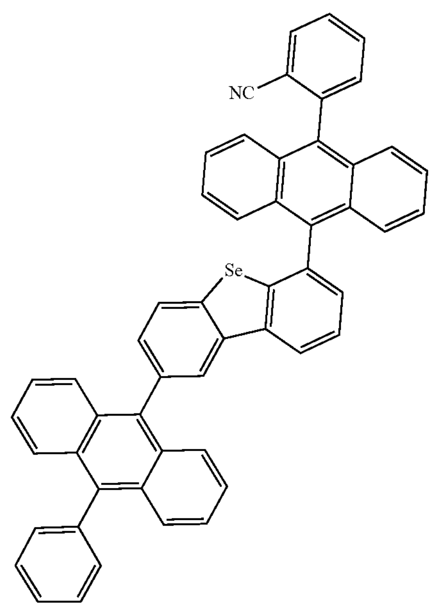

-continued
1199
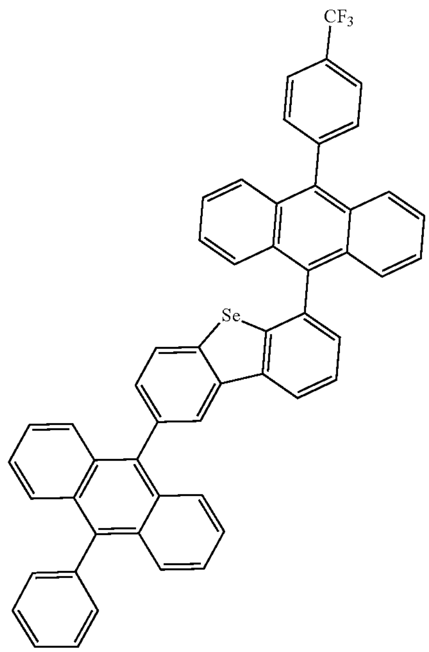
1200
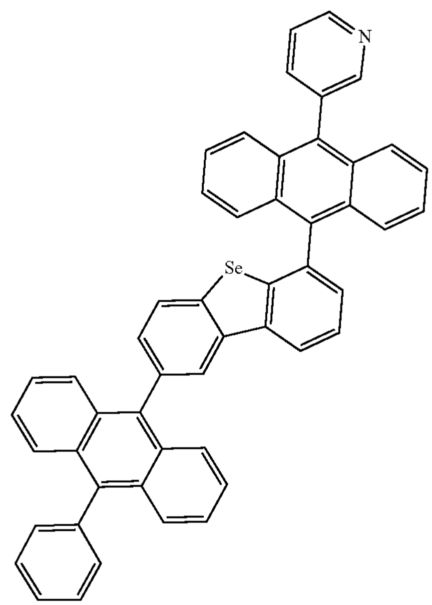
1201
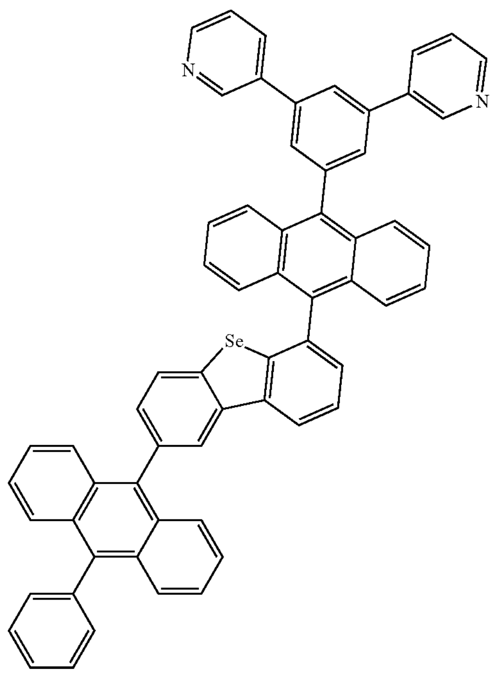
1202
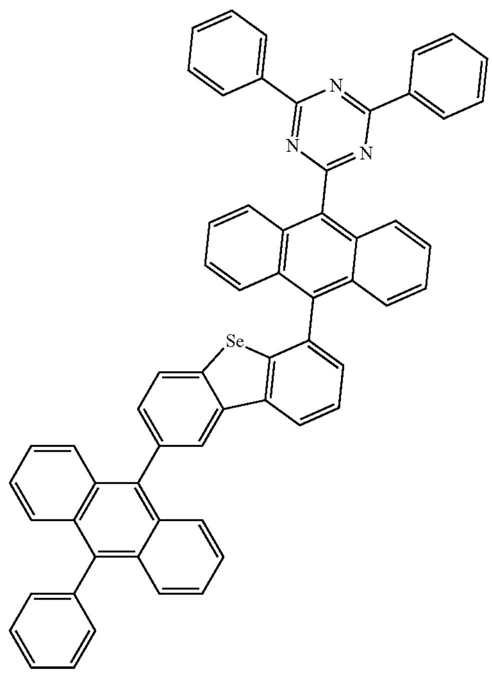

-continued
1203
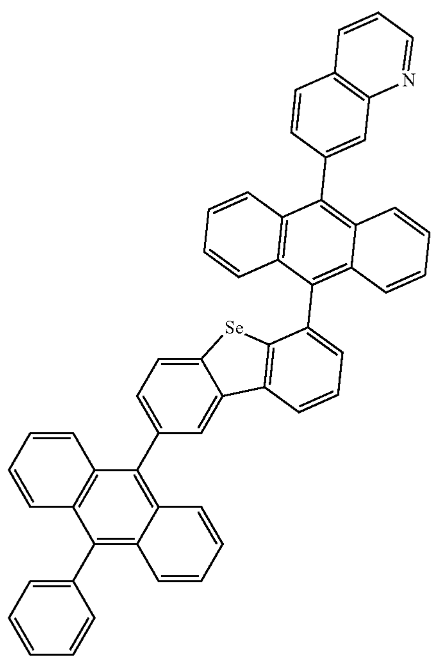
1204
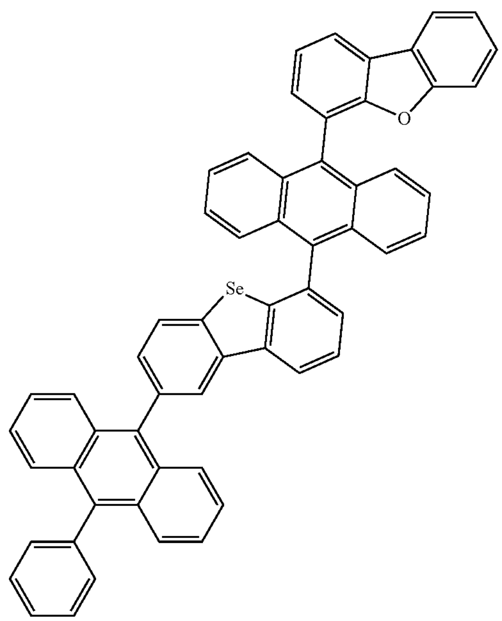
1205
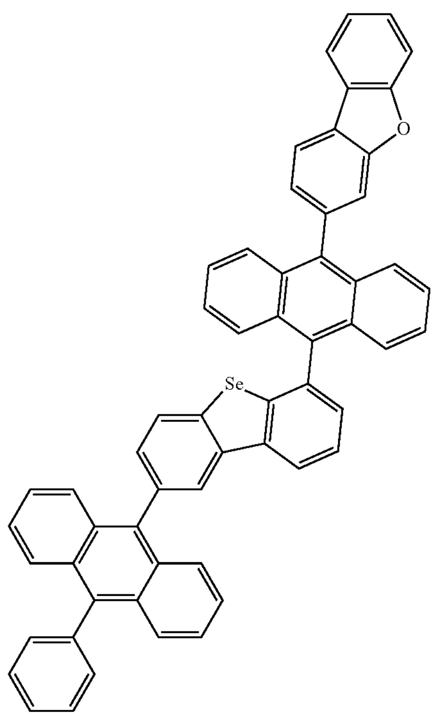
1206
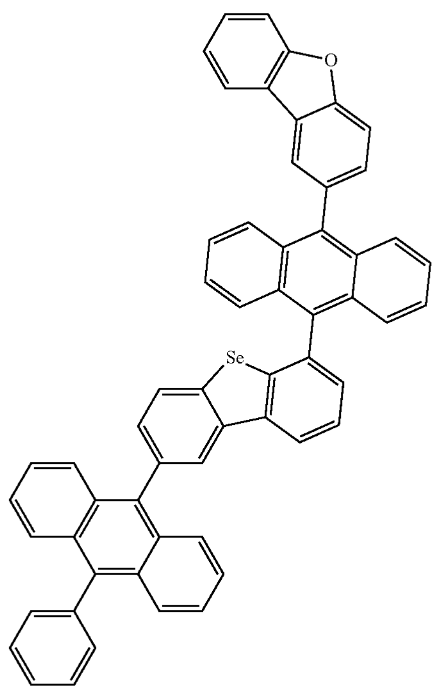

-continued
1207
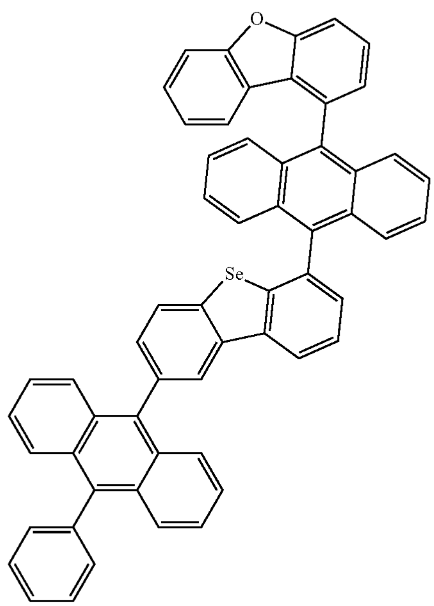
1208
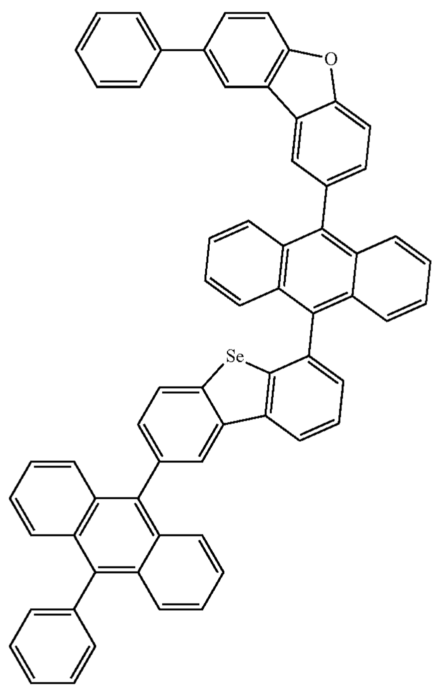
1209
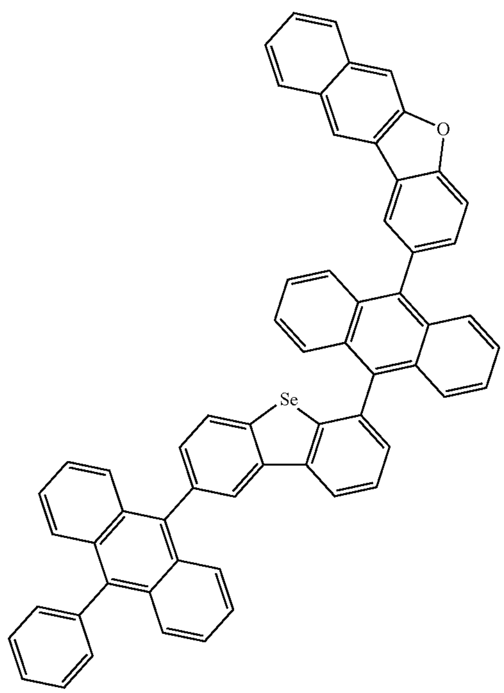
1210
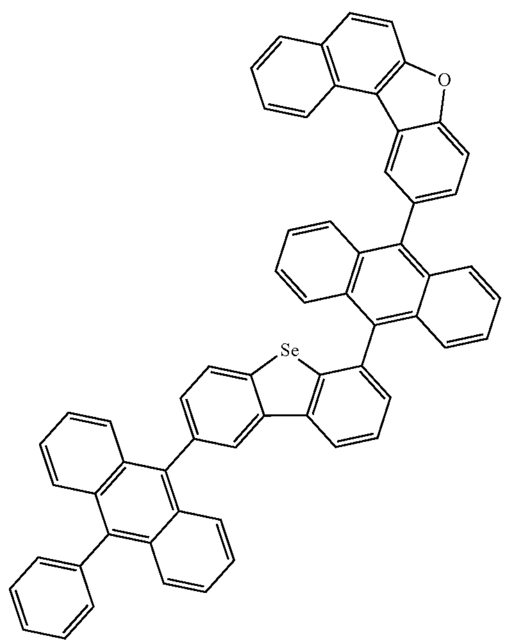

-continued
1211
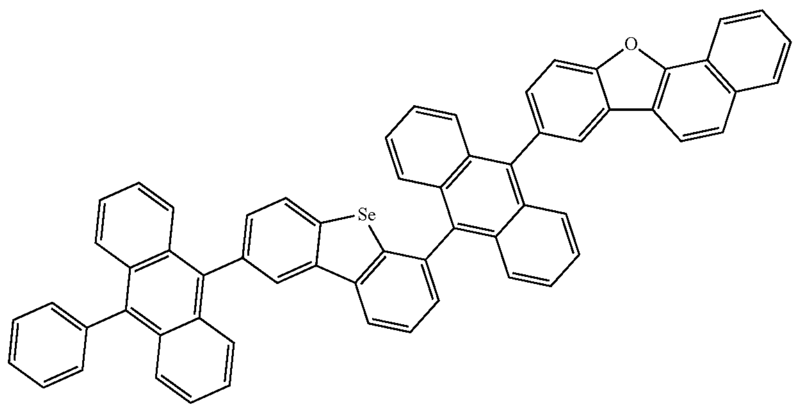
1212
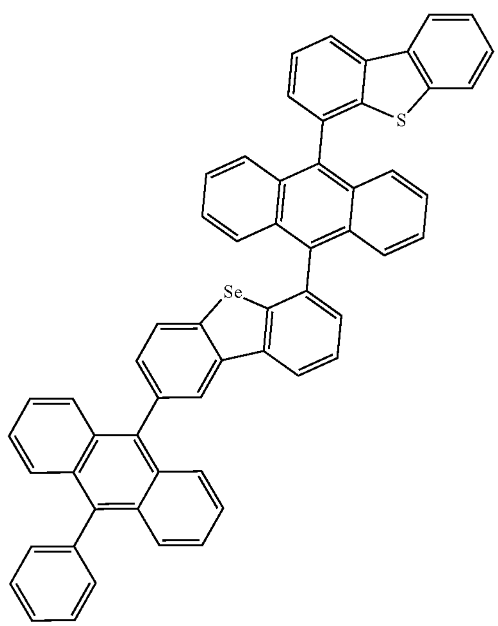

-continued
1213
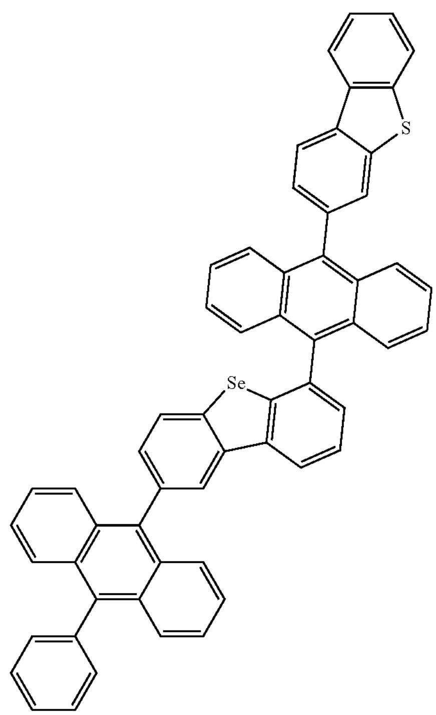
1214
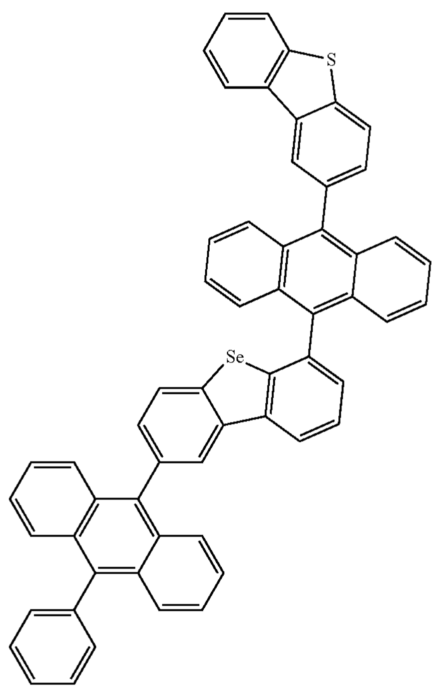
1215
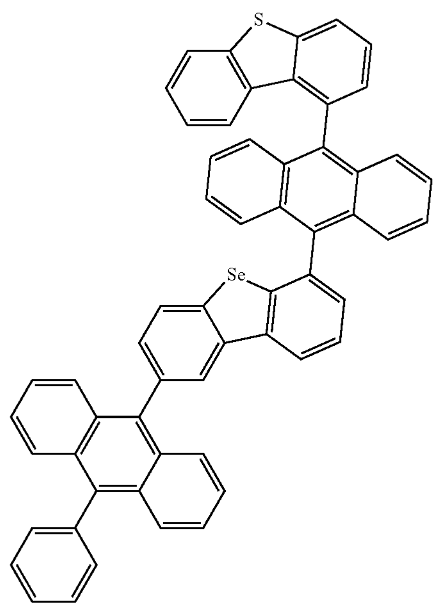
1216
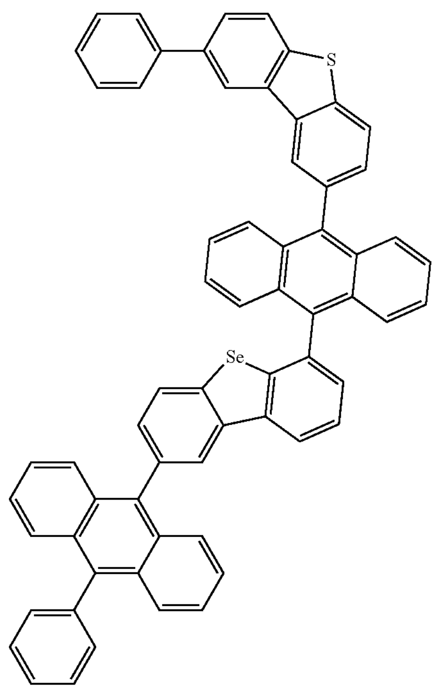

-continued
1217
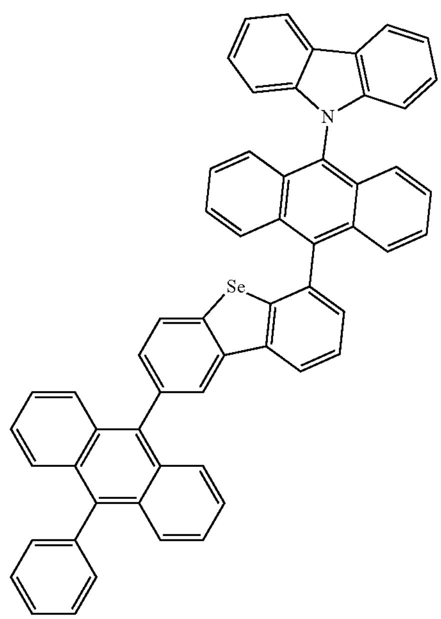
1218
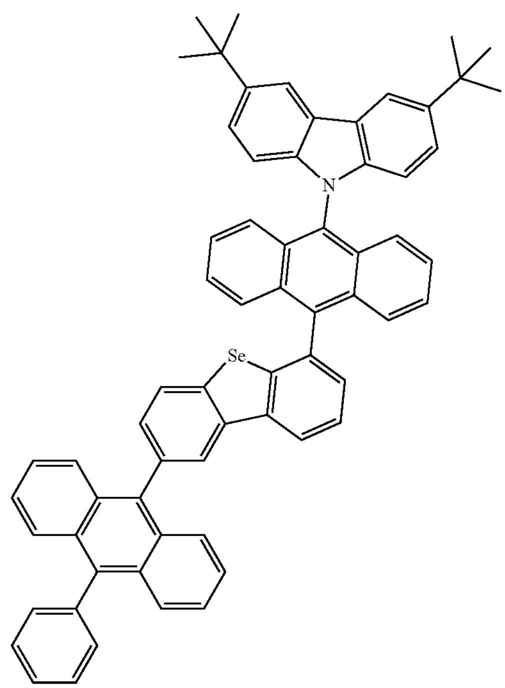
1219
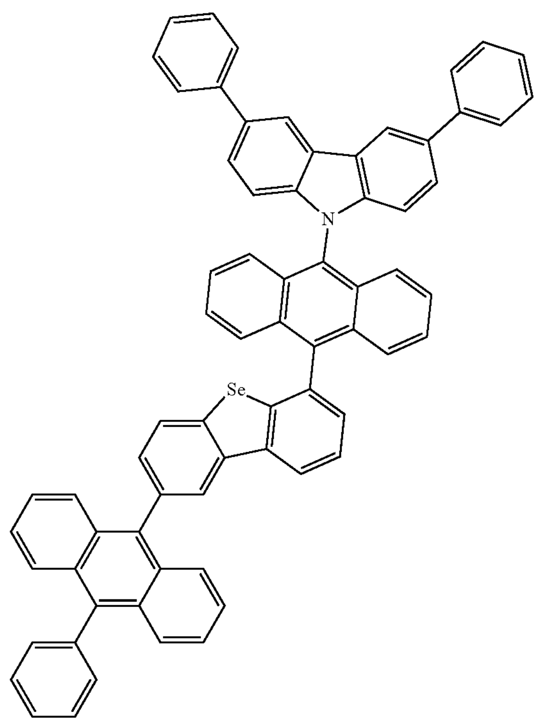
1220
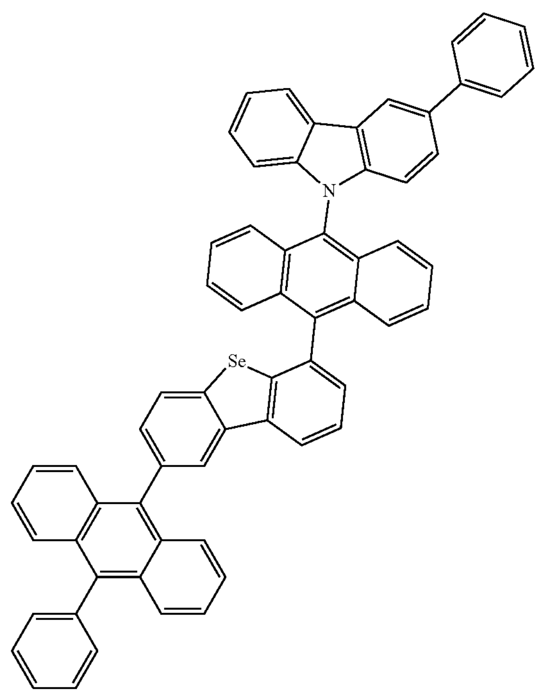

-continued
1221
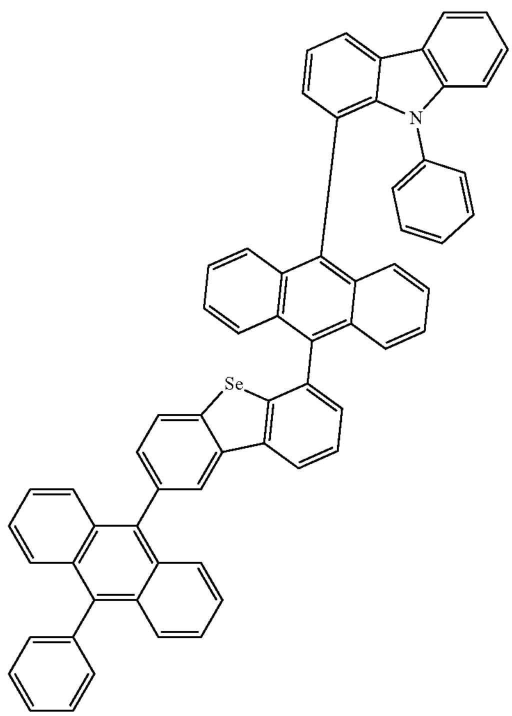
1222
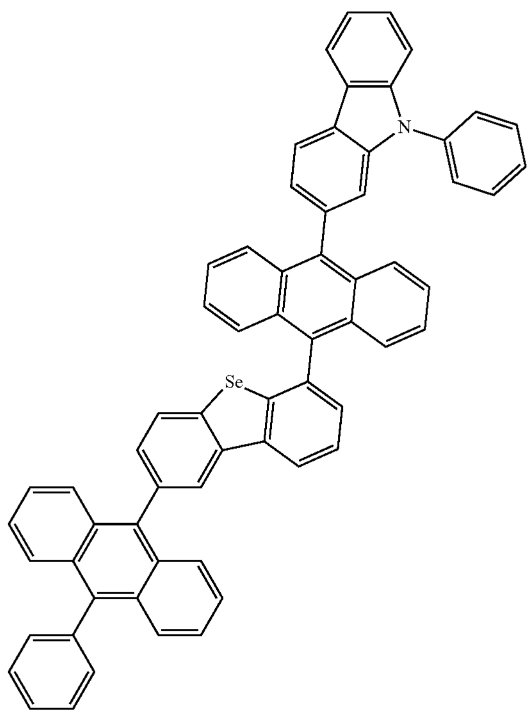
1223
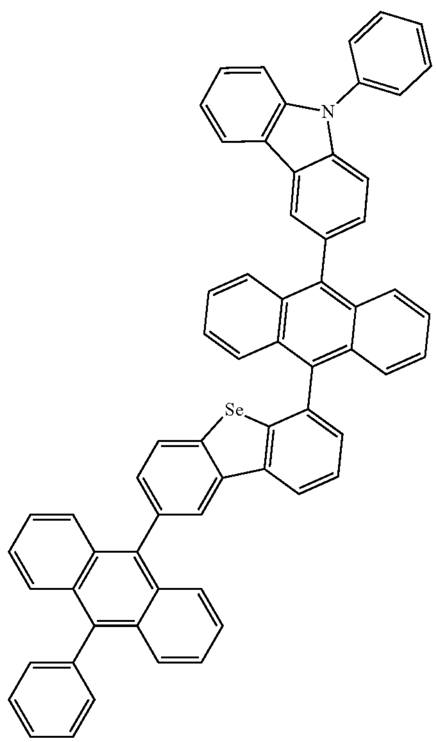
1224
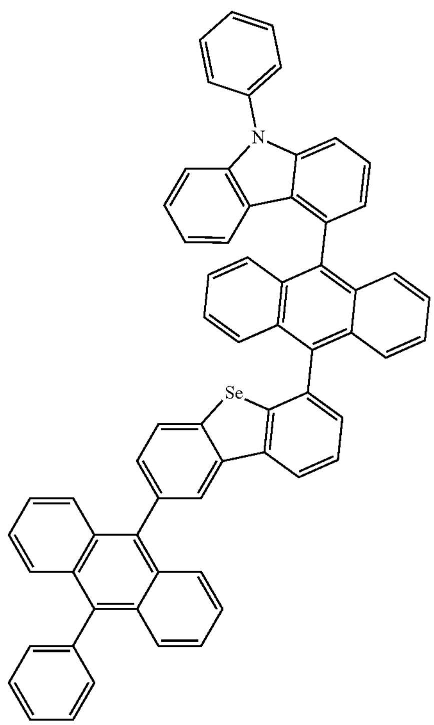

-continued
1225
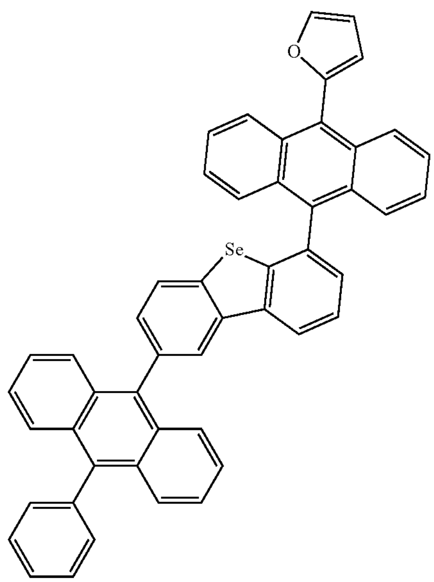
1226
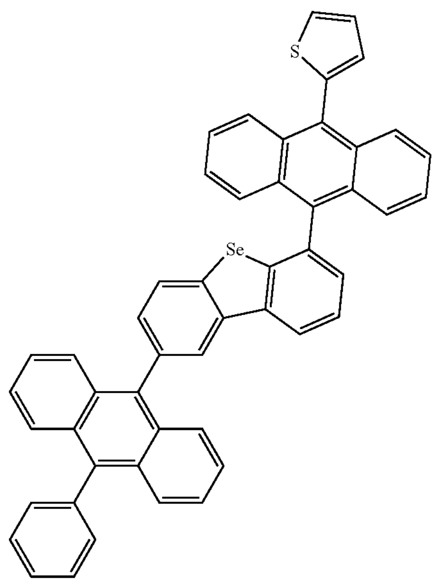
1227
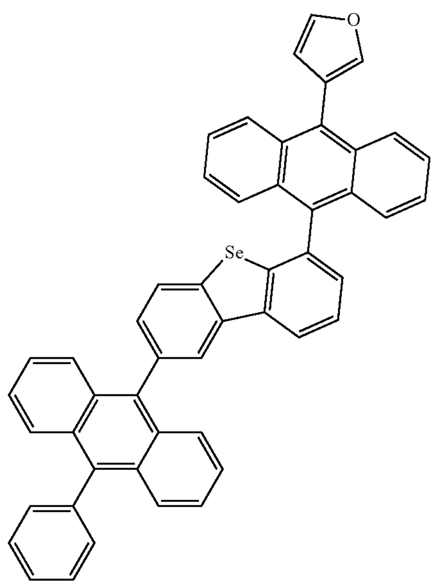
1228
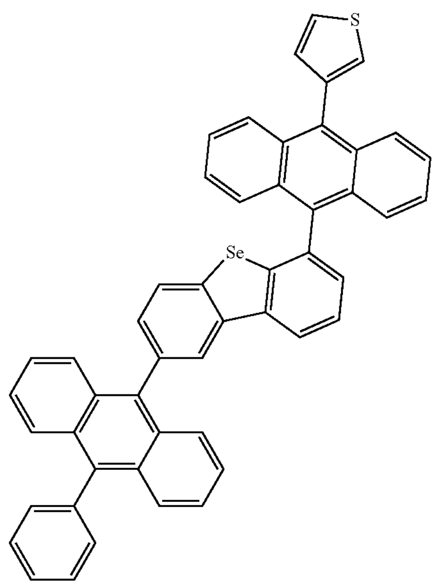

-continued
1229
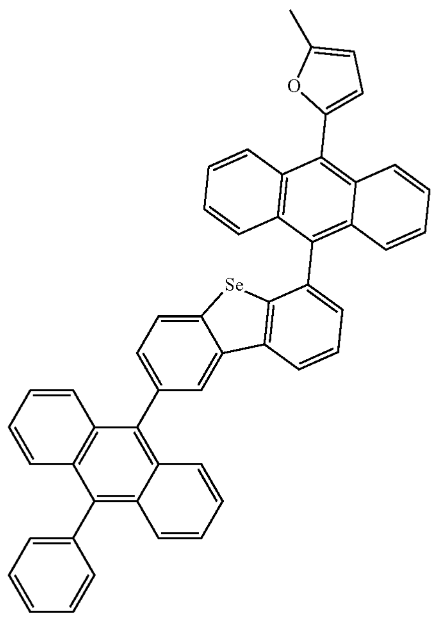
1230
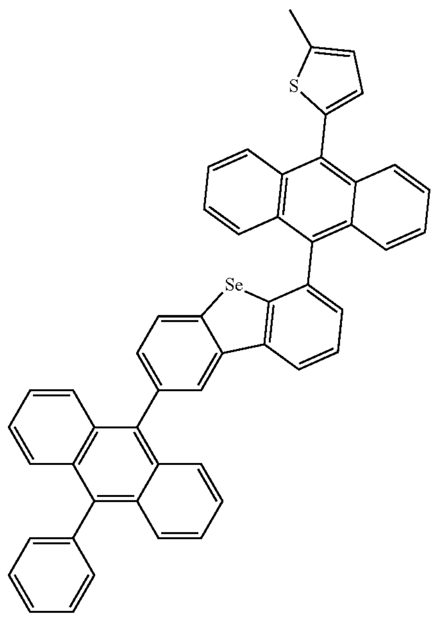
1231
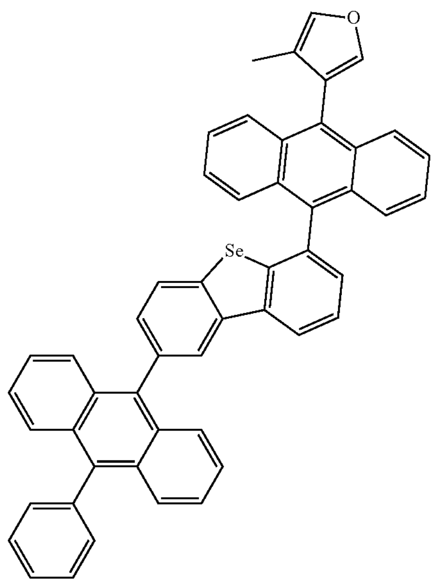
1232
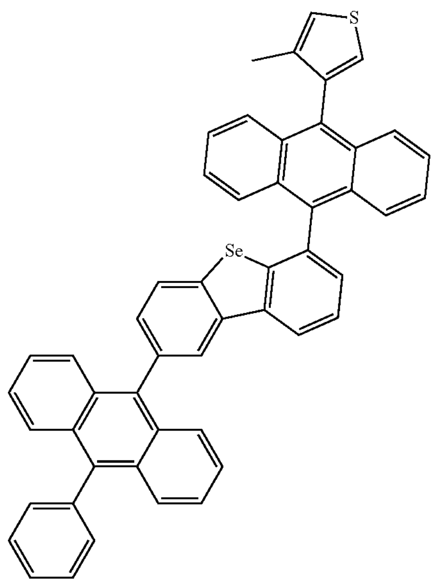

-continued
1233
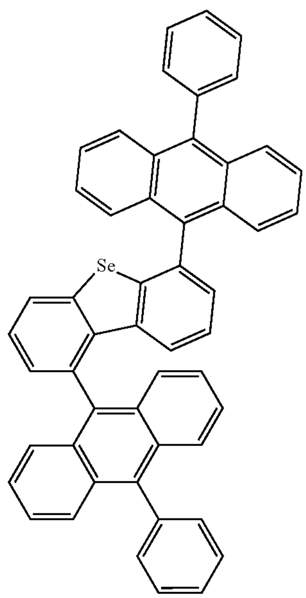
1234
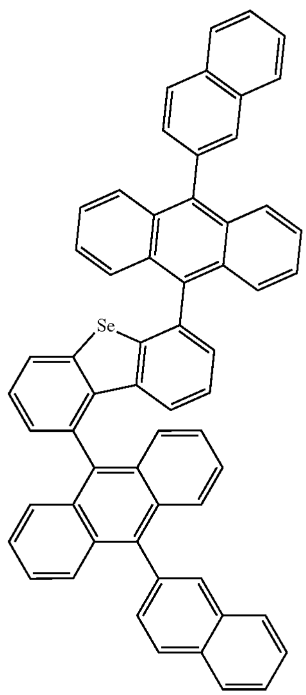
1235
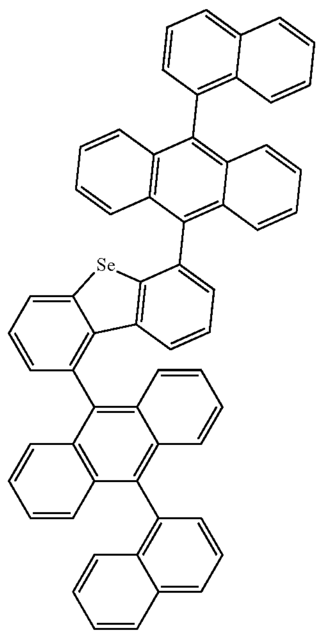
1236
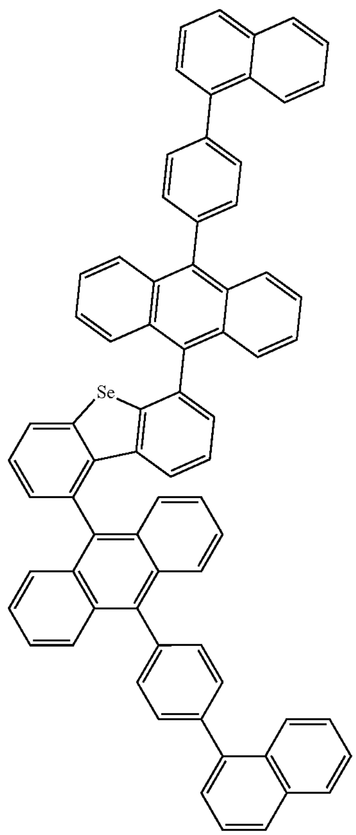

-continued
1237
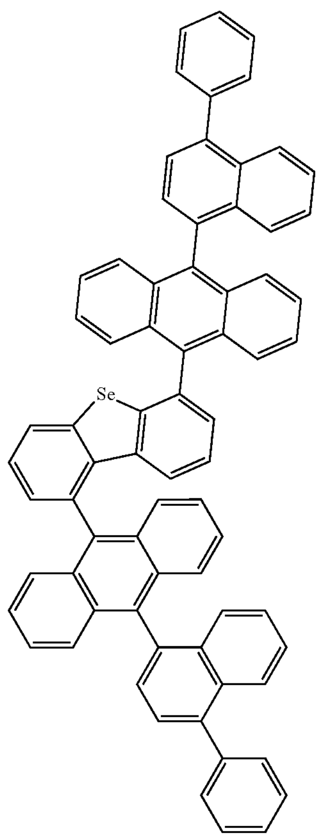
1238
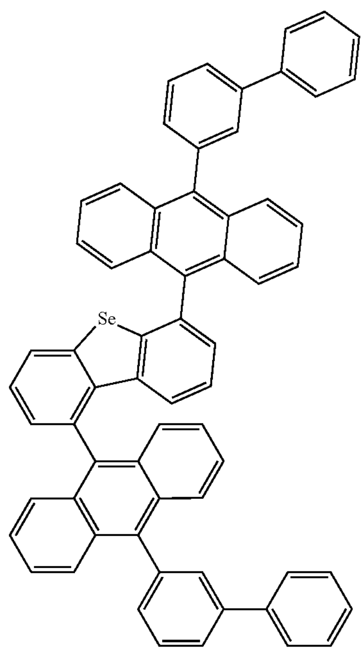
1239
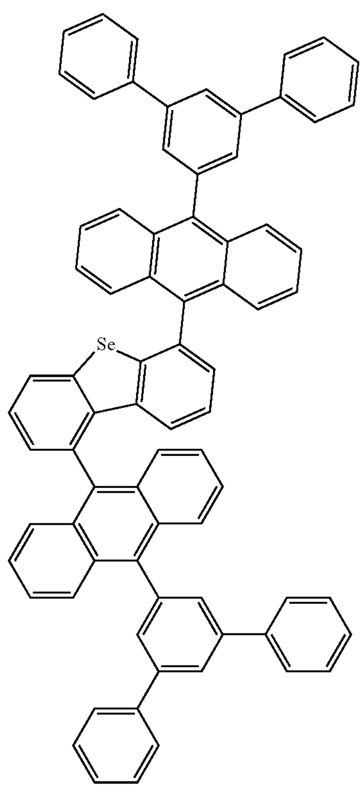
1240
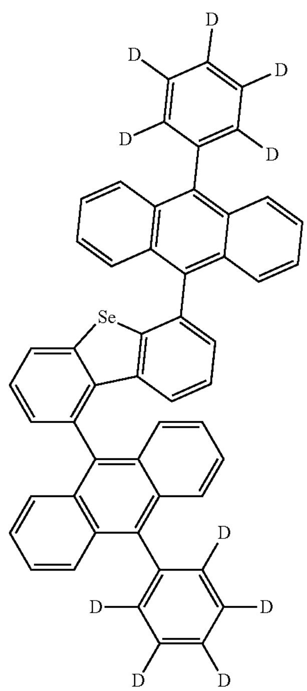

-continued
1241
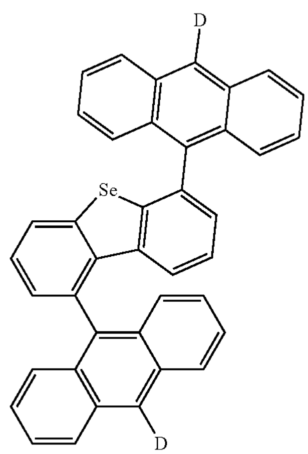
1242
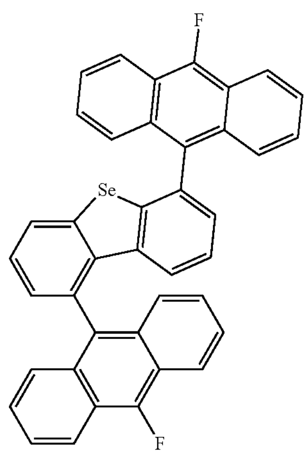
1243
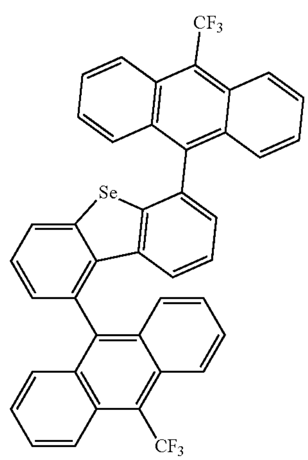
1244
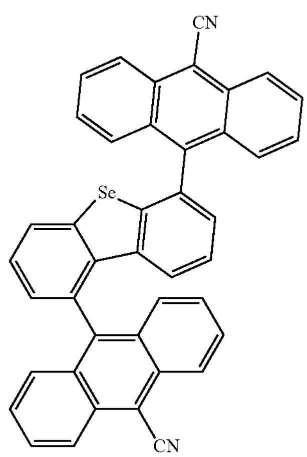
1245
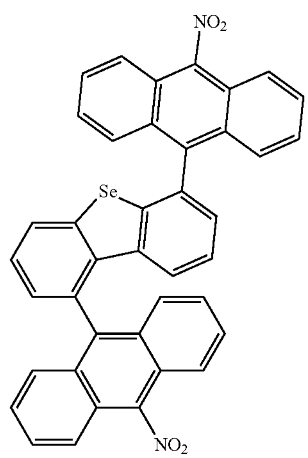
1246
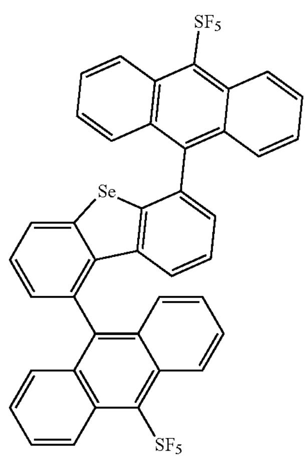

-continued
1247
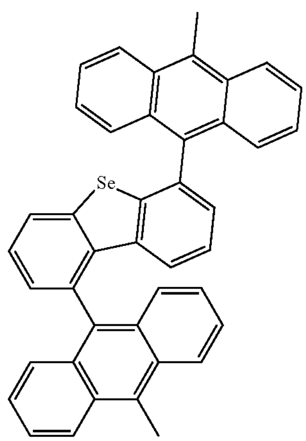
1248
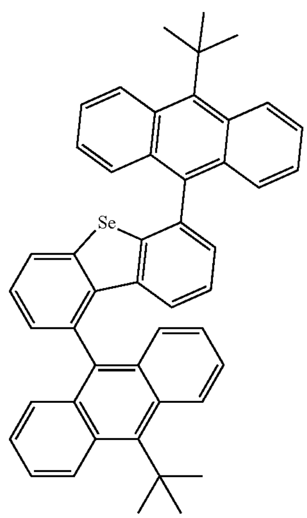
1249
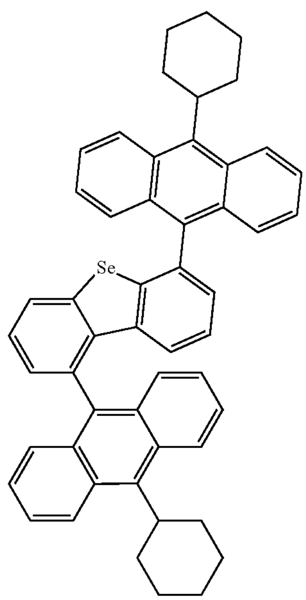
1250
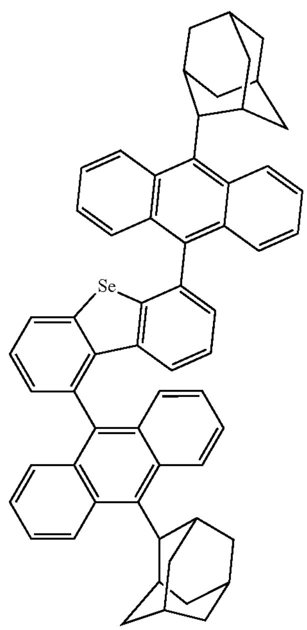

-continued
1251
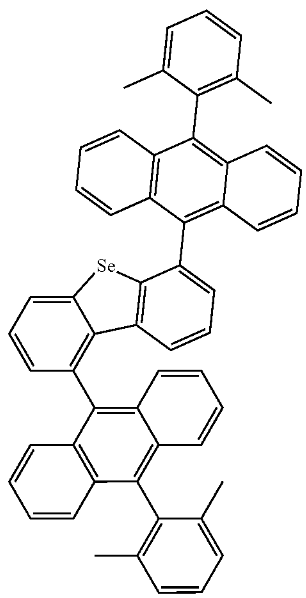
1252
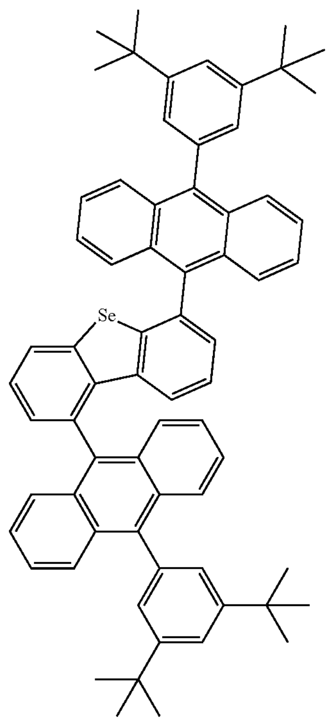
1253
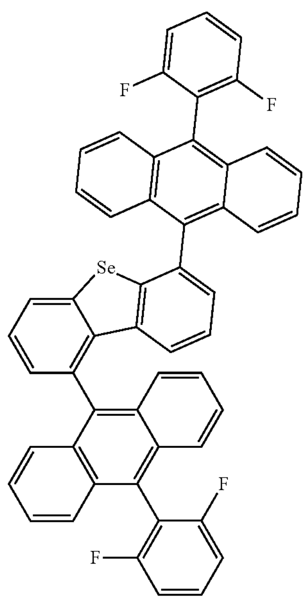
1254
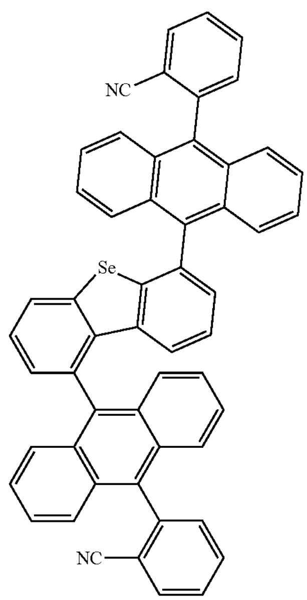

-continued
1255
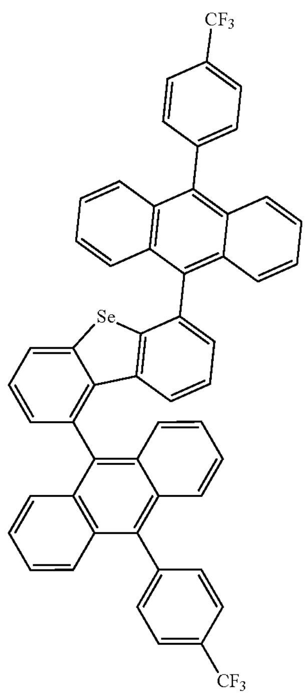
1256
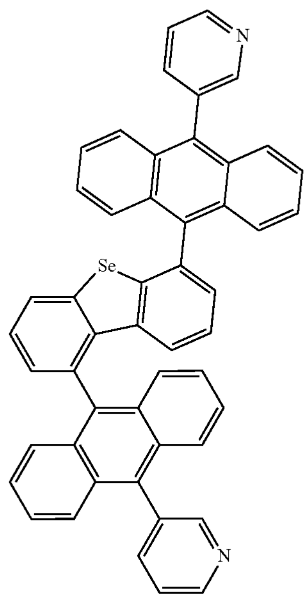
1257
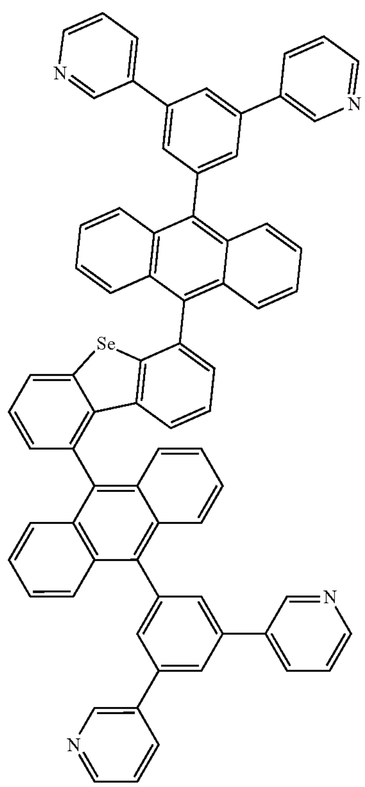
1258
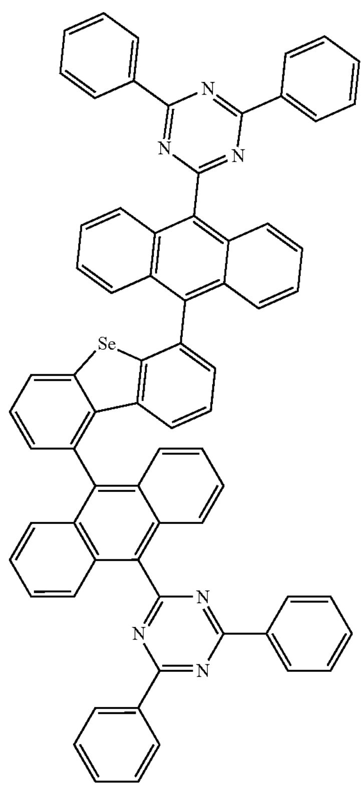

-continued
1259
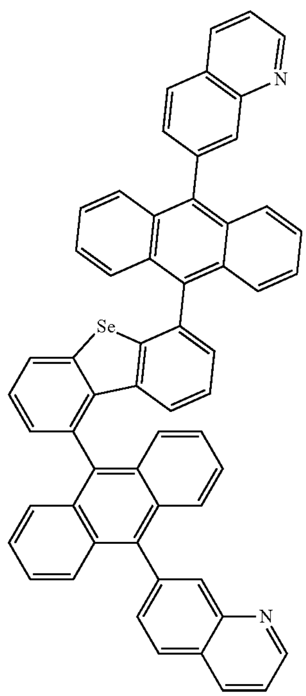
1260
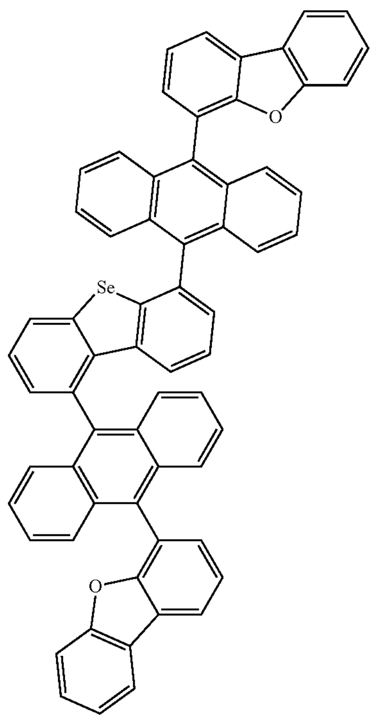
1261
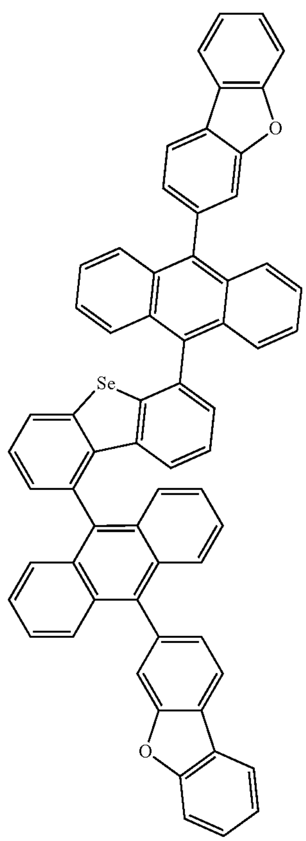
1262
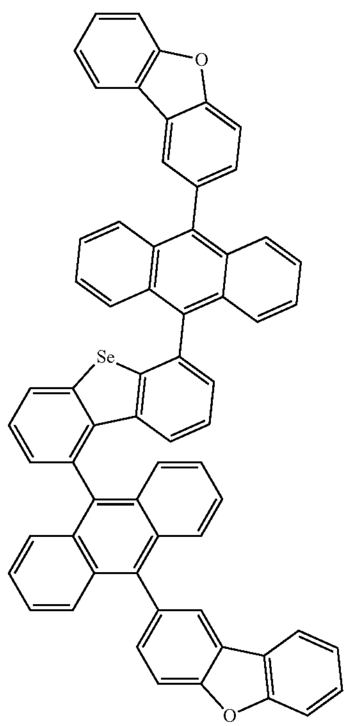

-continued
1263
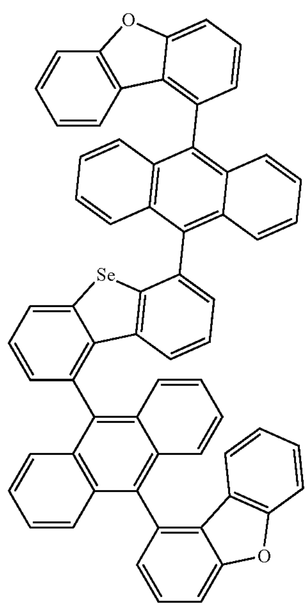
1264
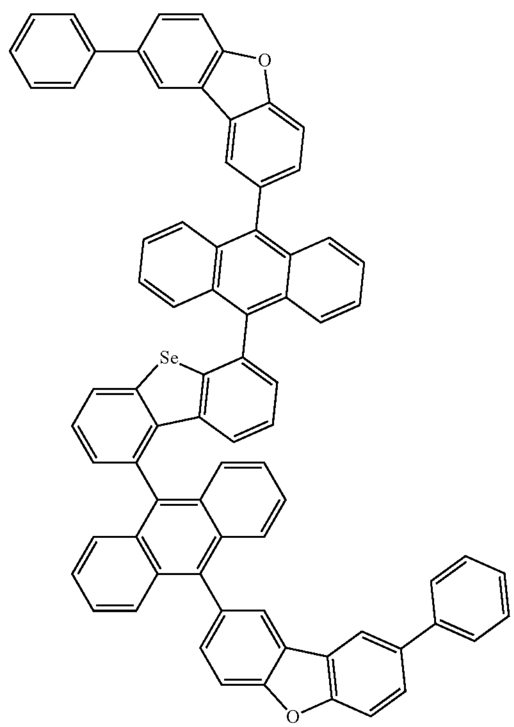
1265
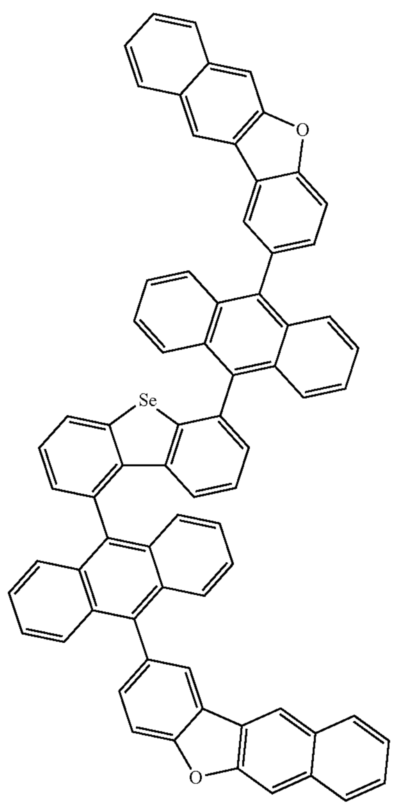
1266
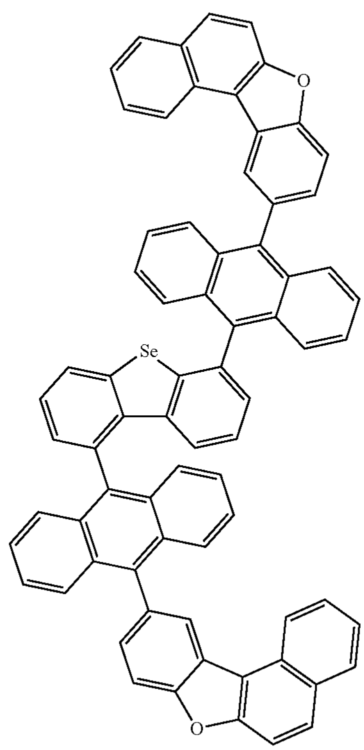

-continued
1267
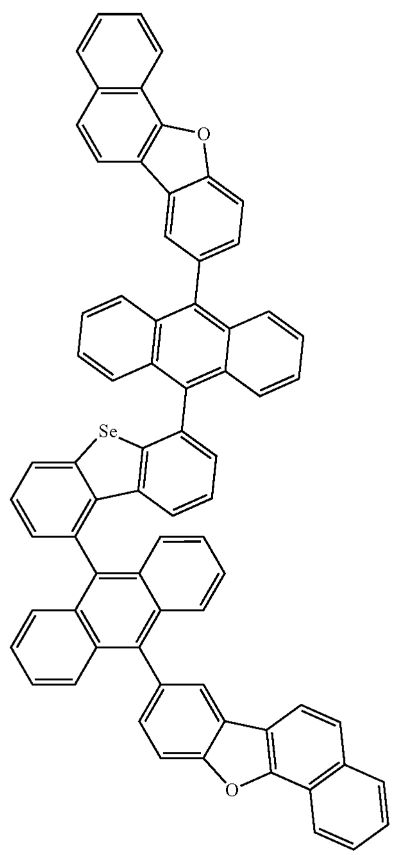
1268
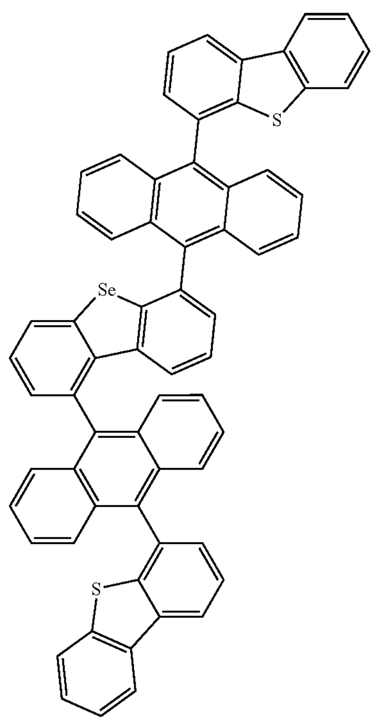
1269
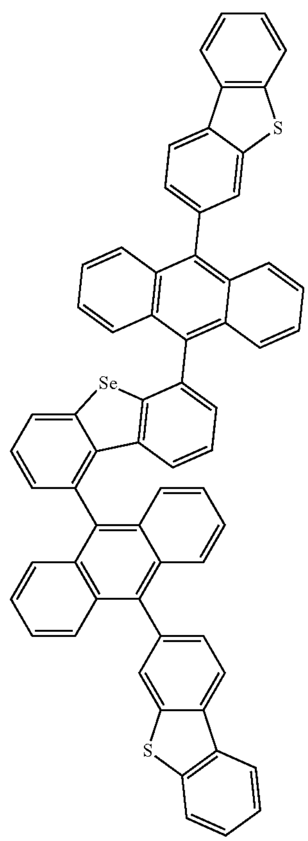
1270
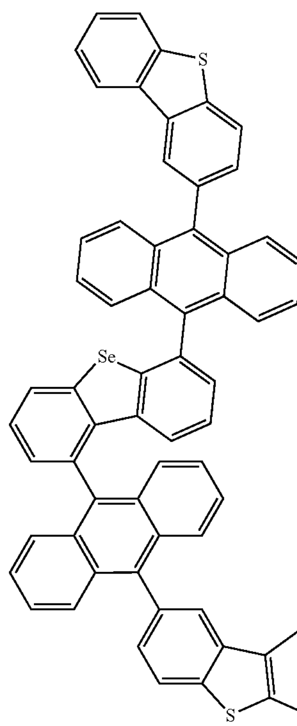

-continued
1271
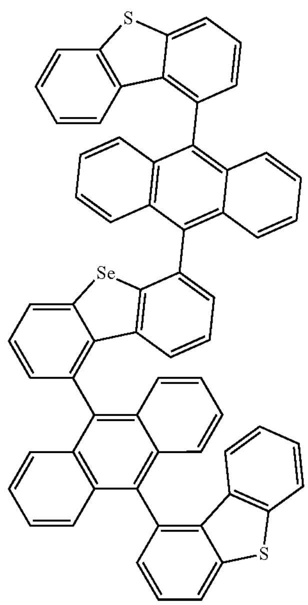
1272
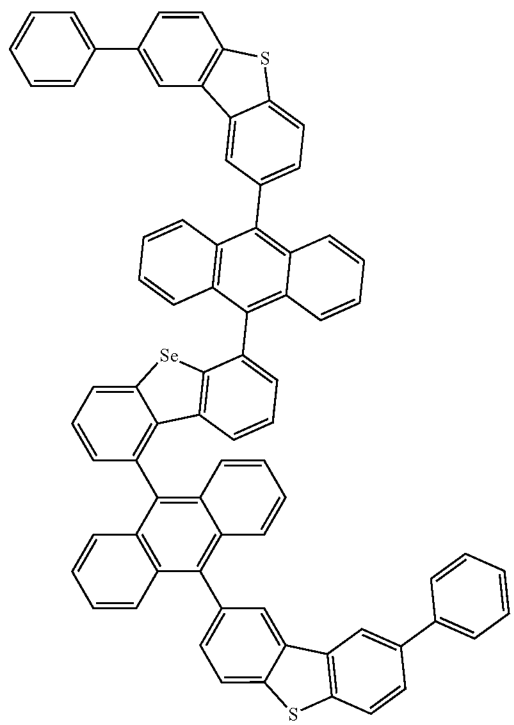
1273
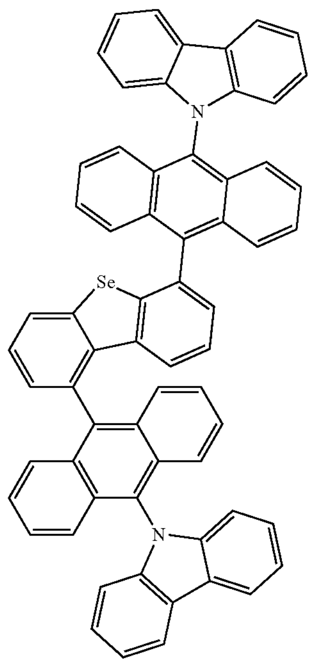
1274
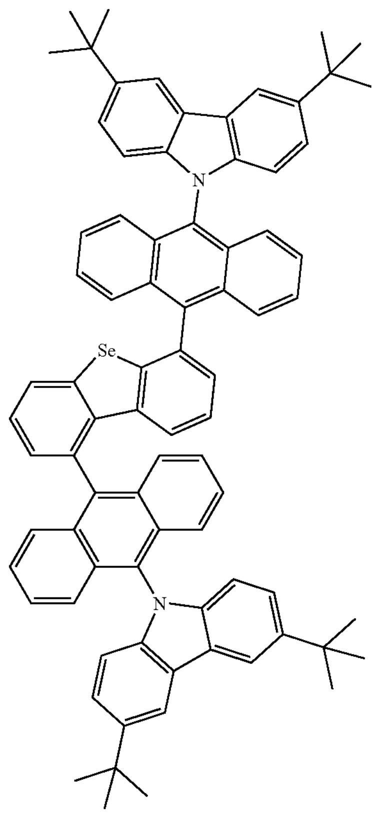

-continued
1275
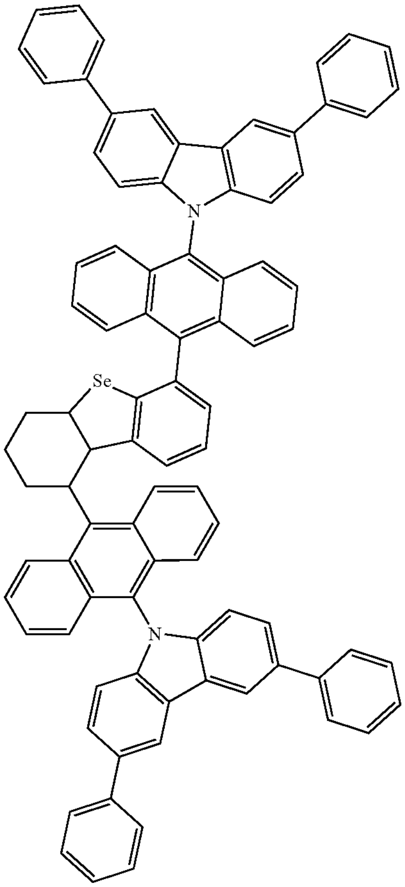
1276
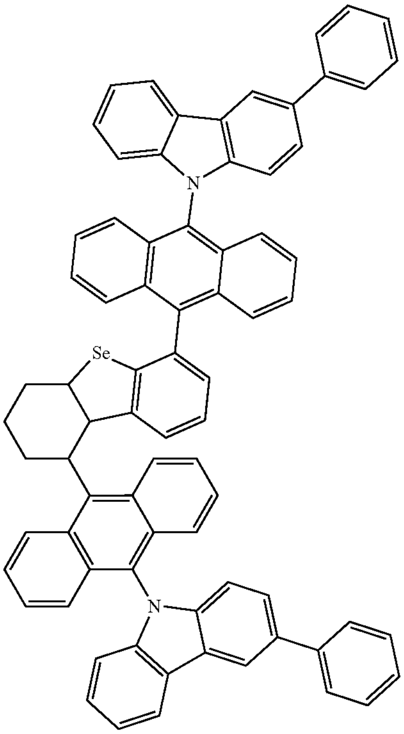

-continued
1277
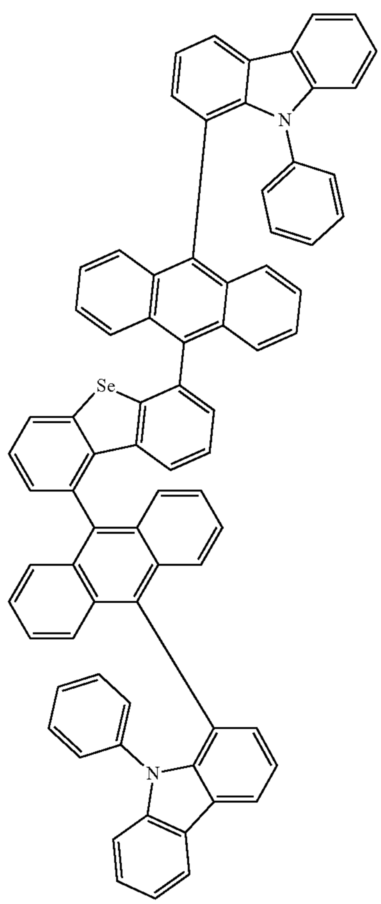
1278
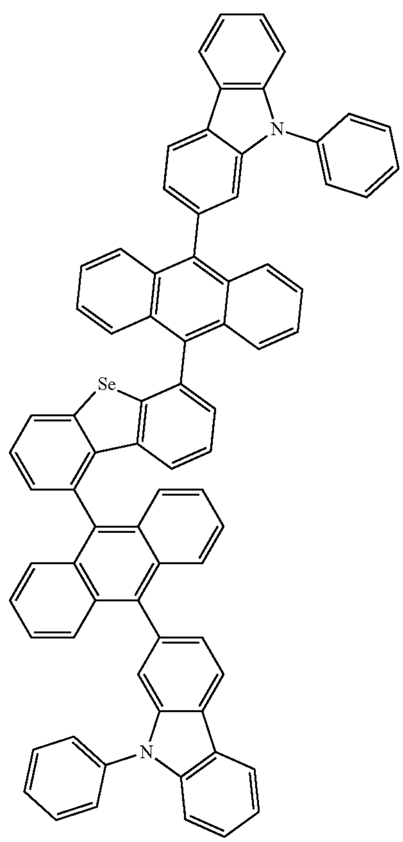

-continued
1279
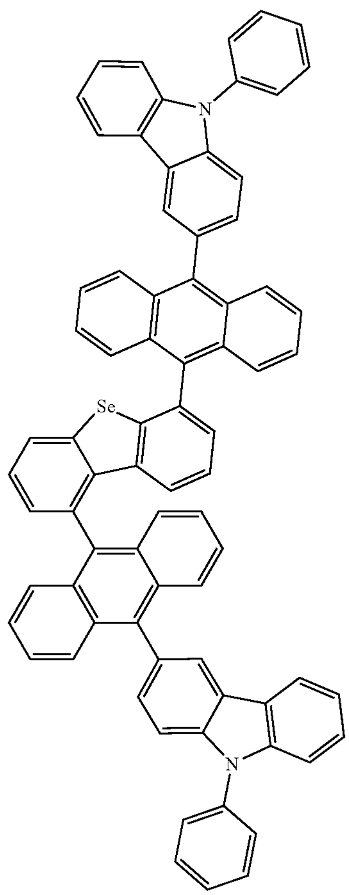
1280
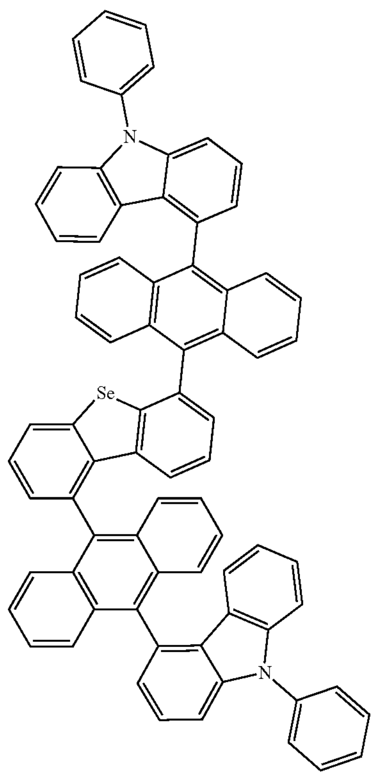
1281
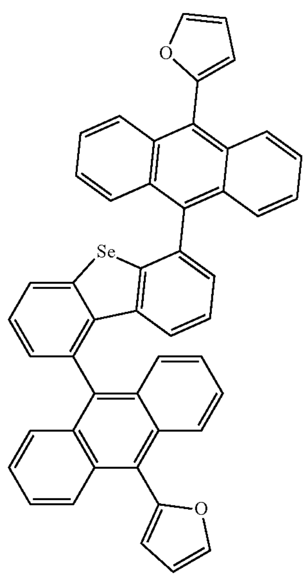
1282
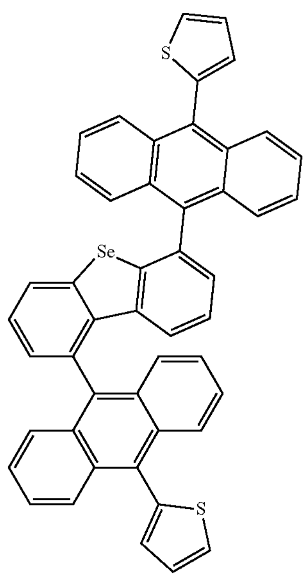

-continued
1283
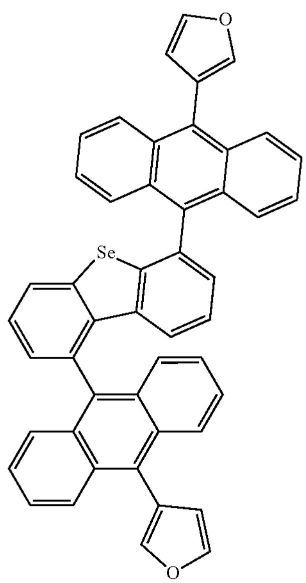
1284
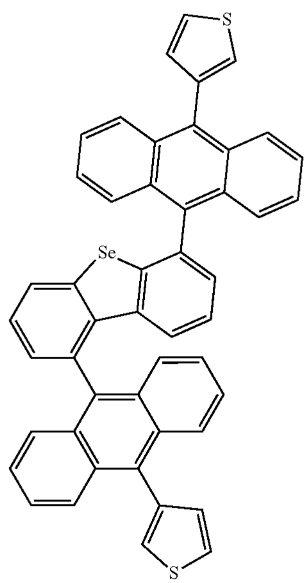
1285
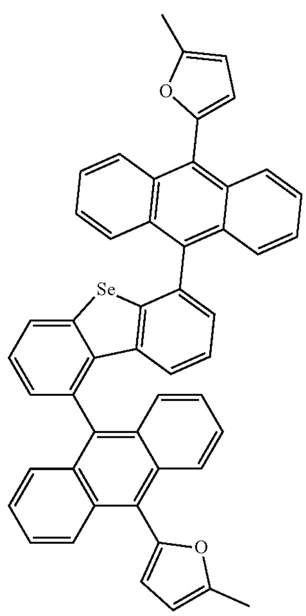
1286
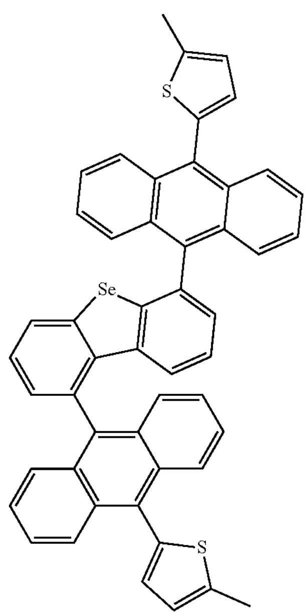

-continued
1287
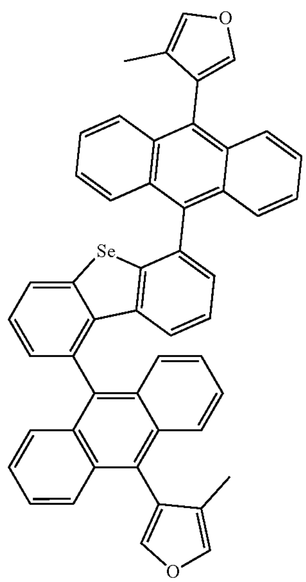
1288
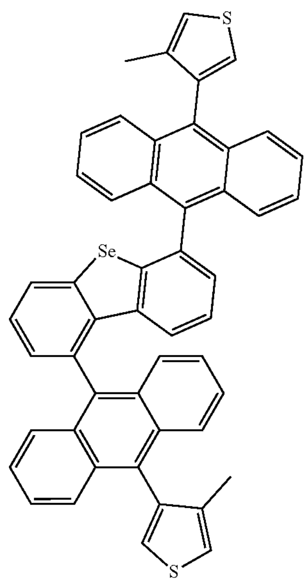
1289
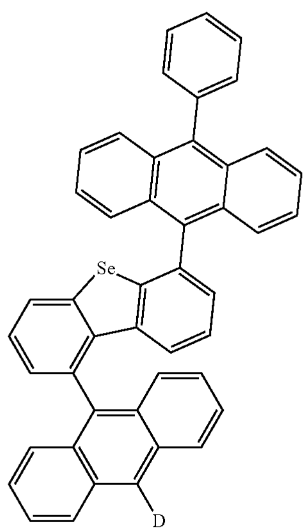
1290
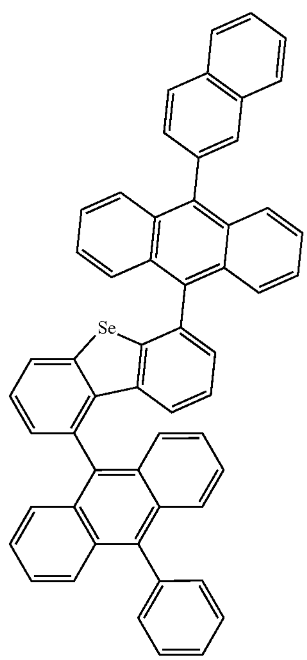

-continued
1291
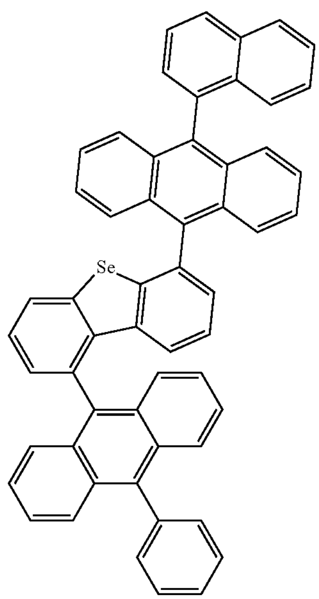
1292
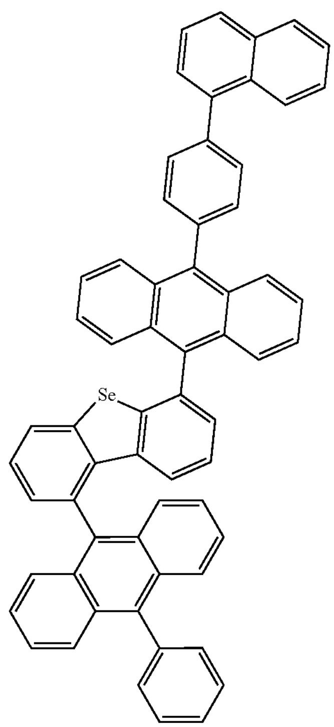
1293
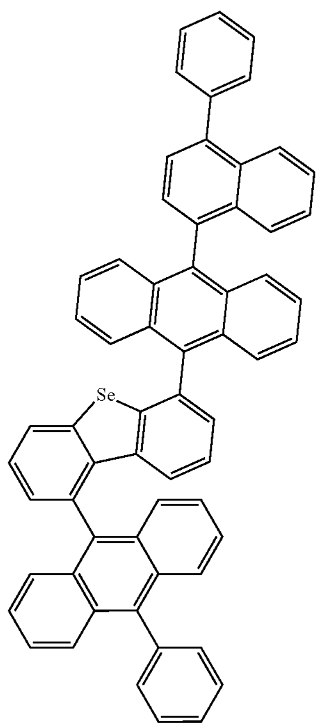
1294
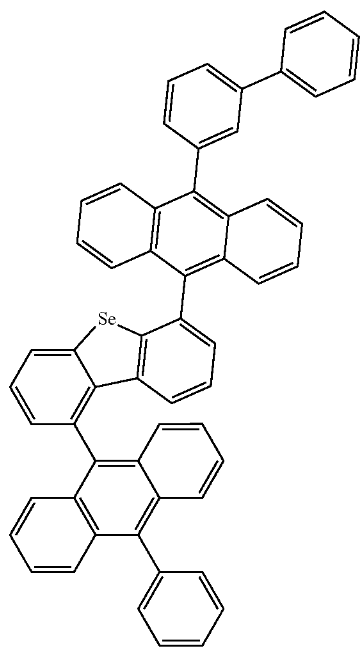

-continued
1295
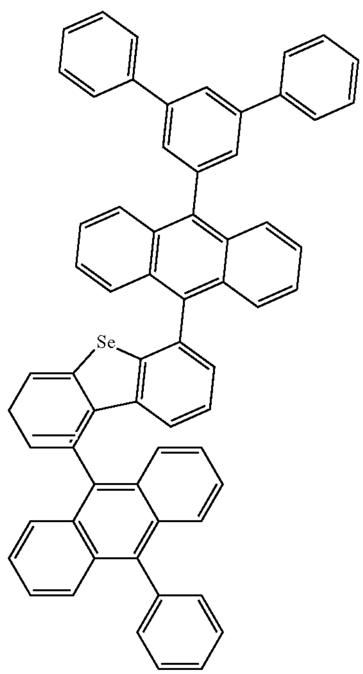
1296
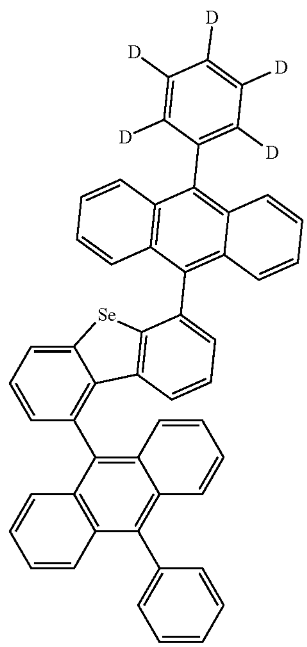
1297
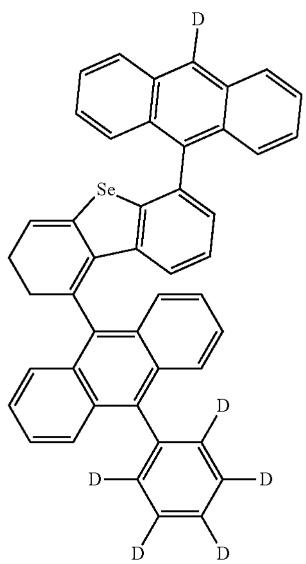
1298
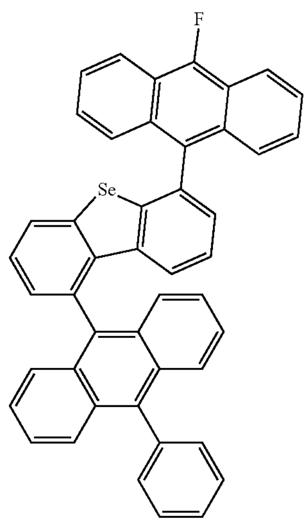

-continued
1299
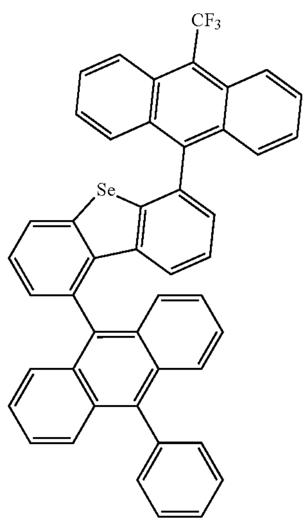
1300
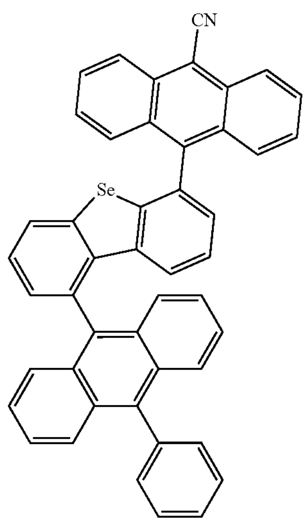
1301
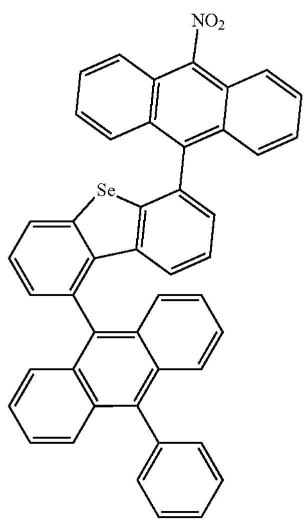
1302
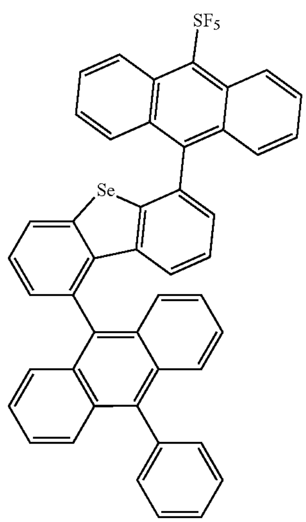
1303
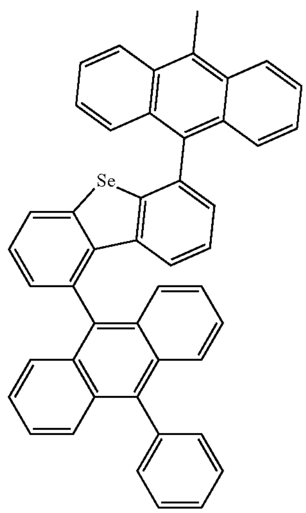
1304
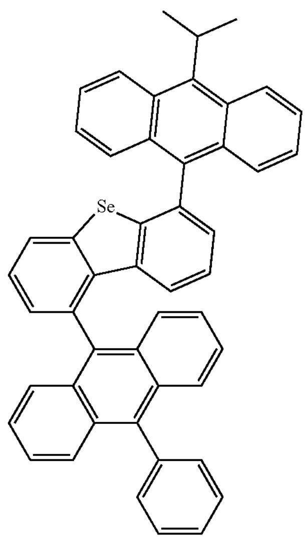

-continued
1305
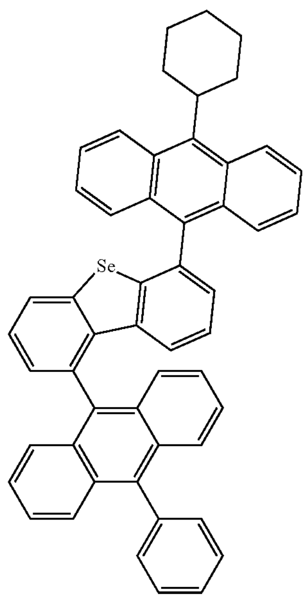
1306
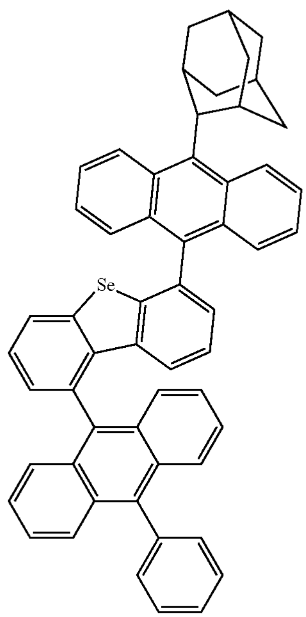
1307
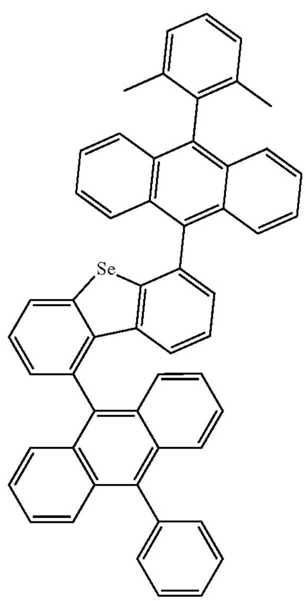
1308
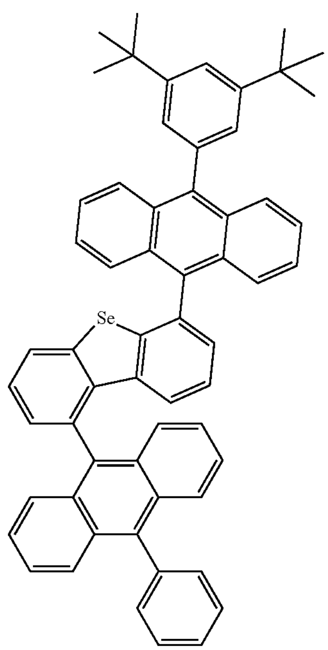

-continued
1309
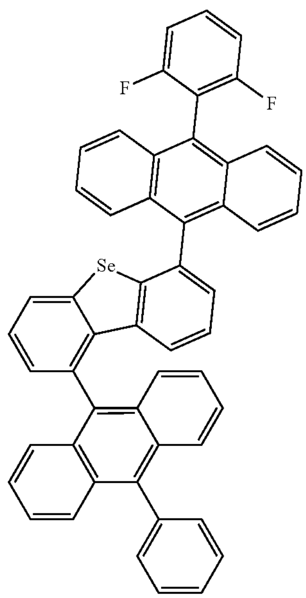
1310
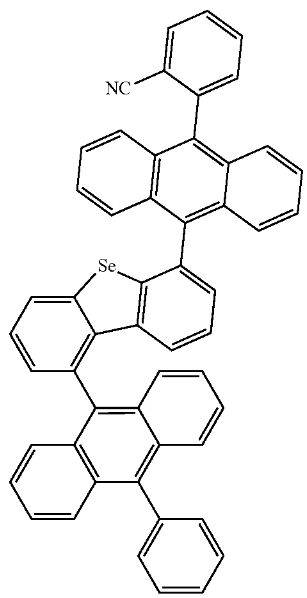
1311
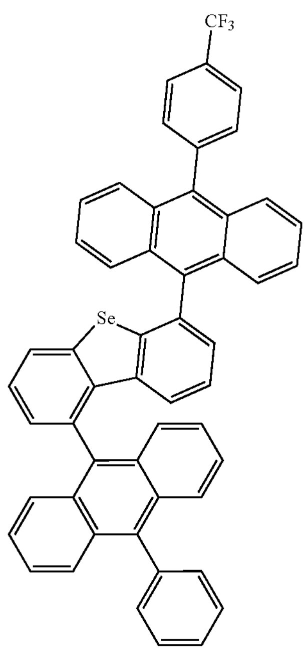
1312
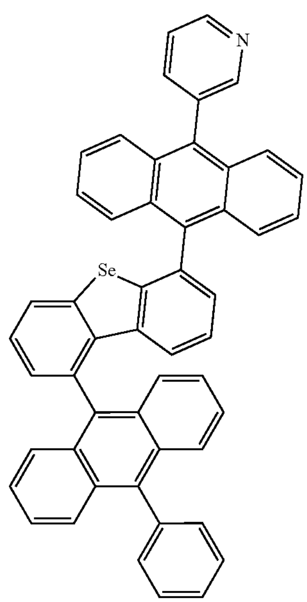

-continued
1313
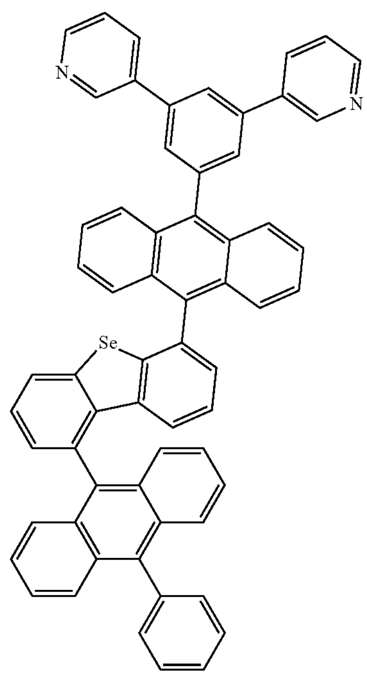
1314
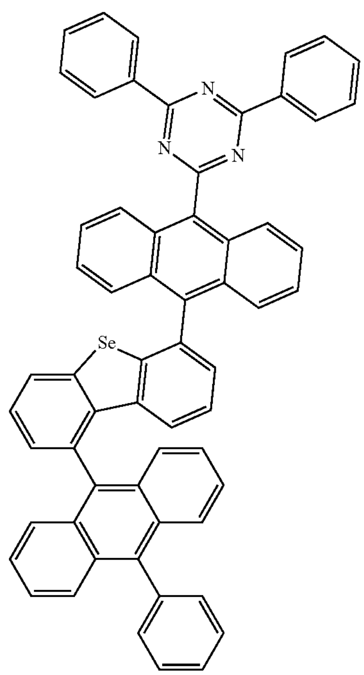
1315
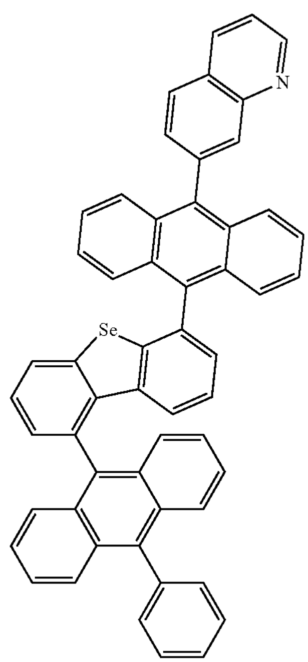
1316
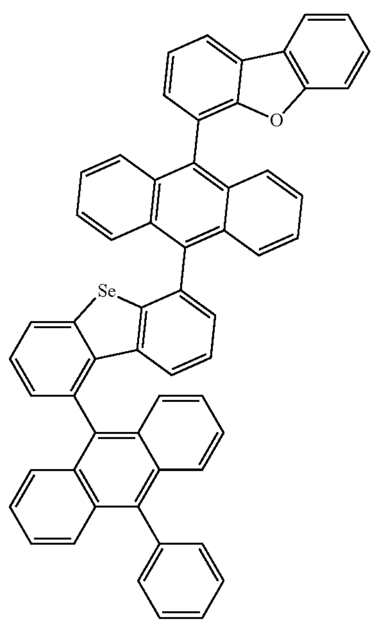

-continued
1317
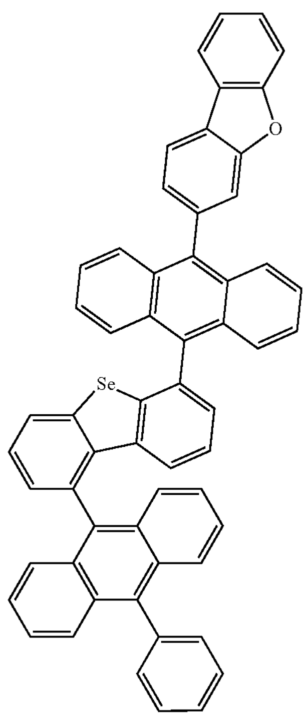
1318
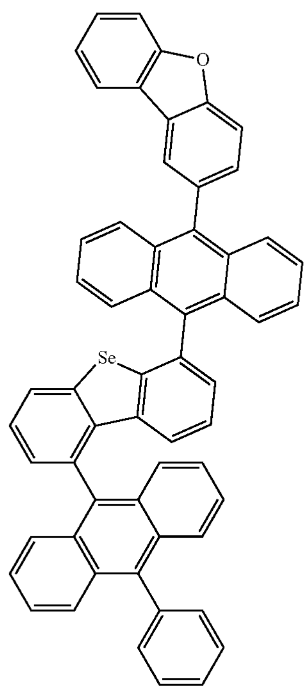
1319
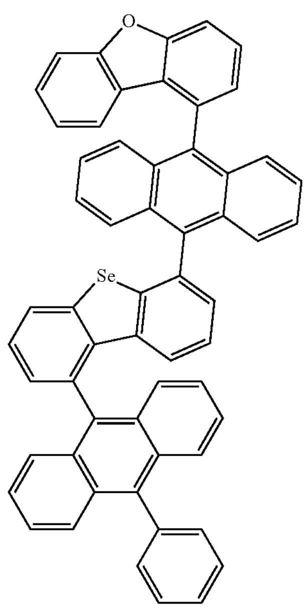
1320
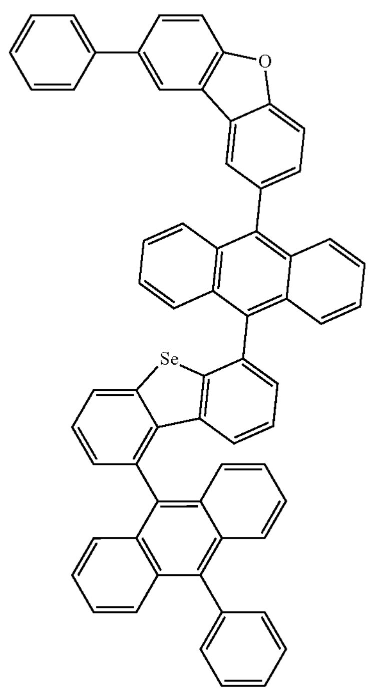

-continued
1321
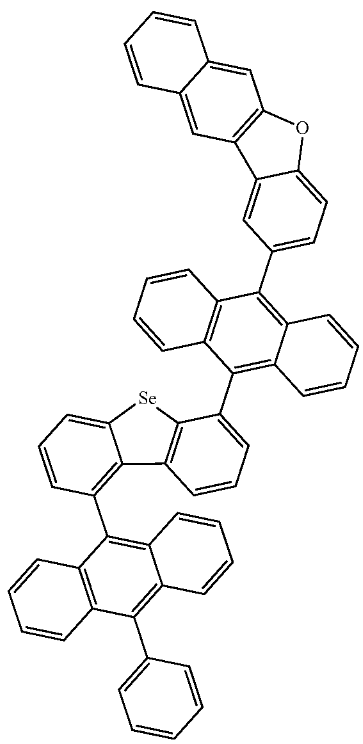
1322
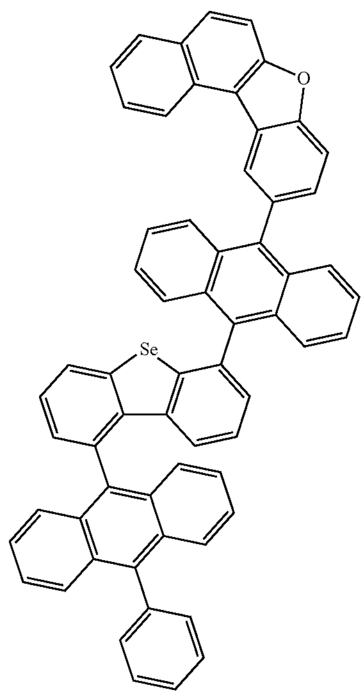
1323
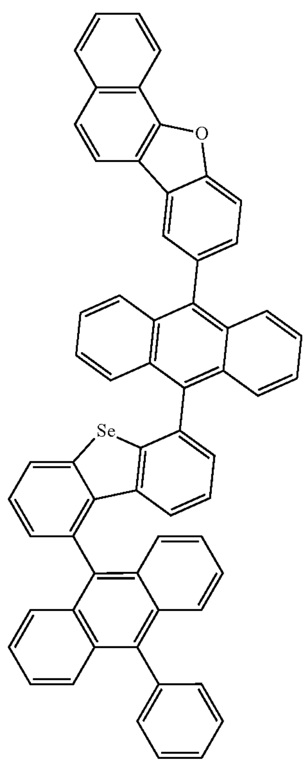
1324
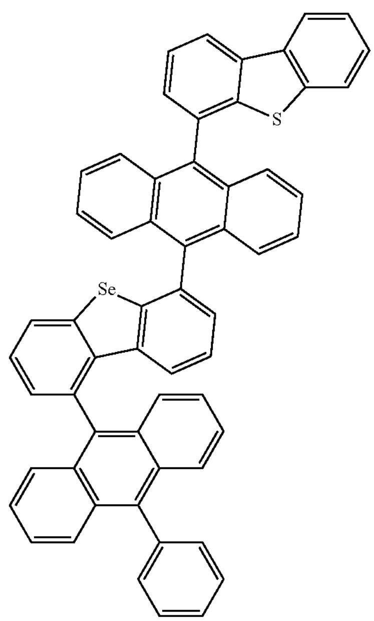

-continued
1325
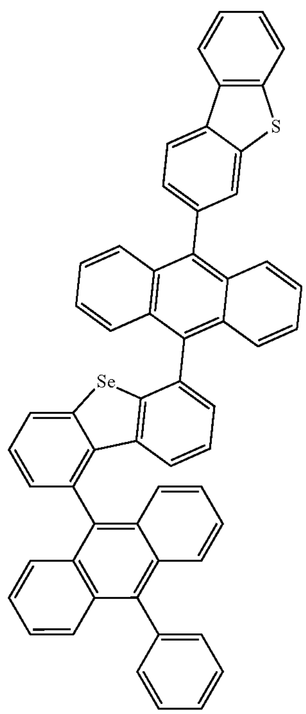
1326
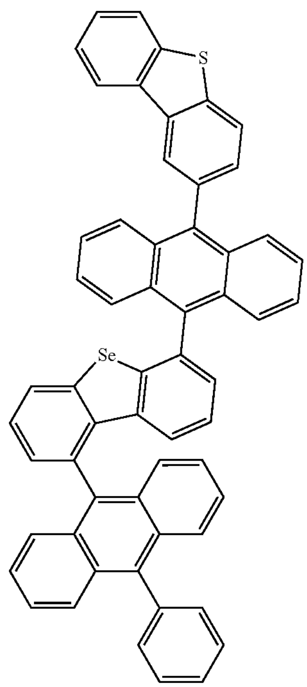
1327
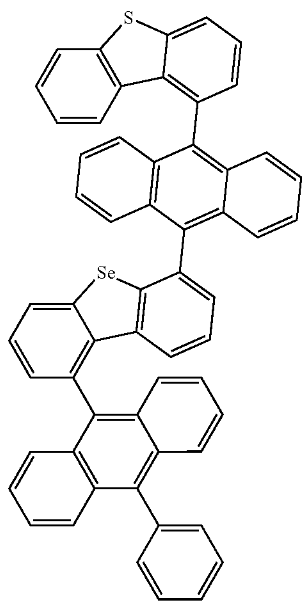
1328
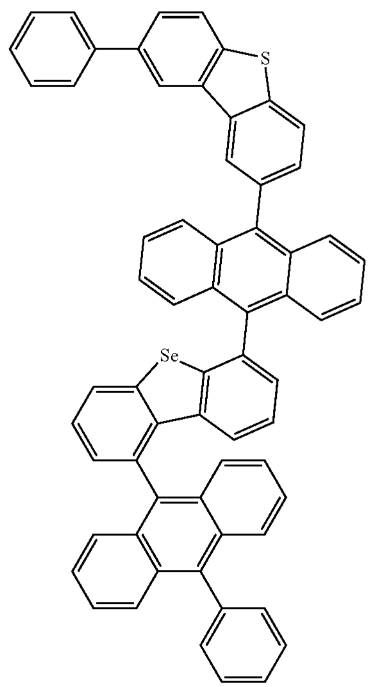

-continued
1329
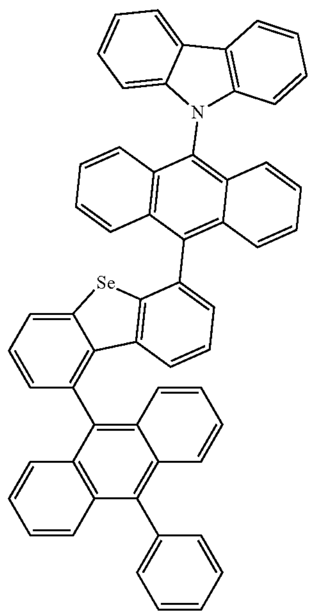
1330
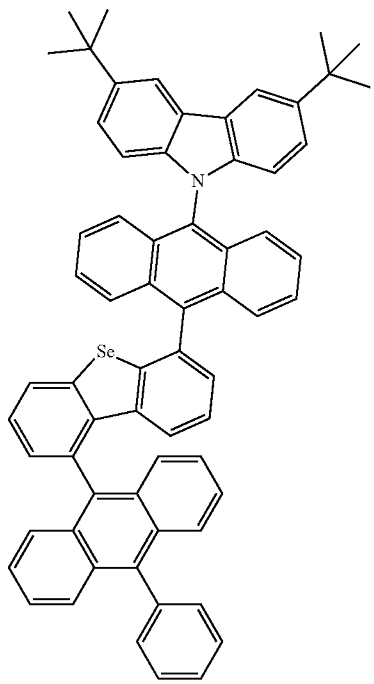
1331
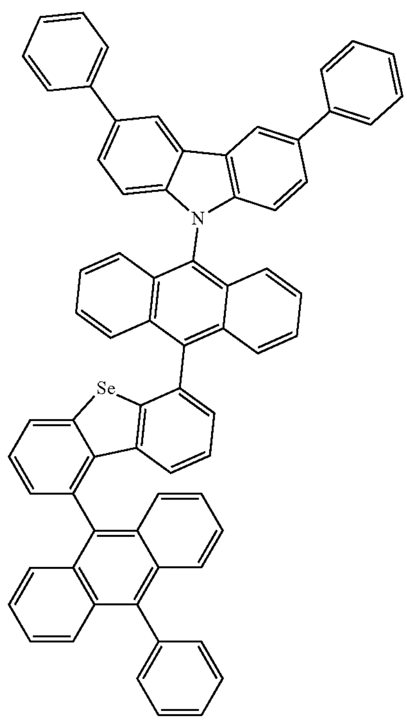
1332
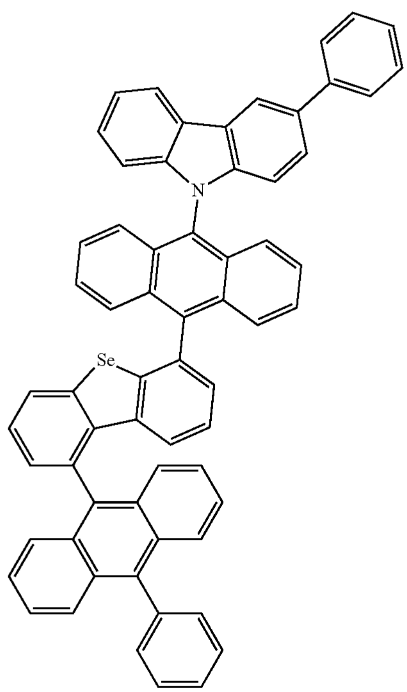

-continued
1333
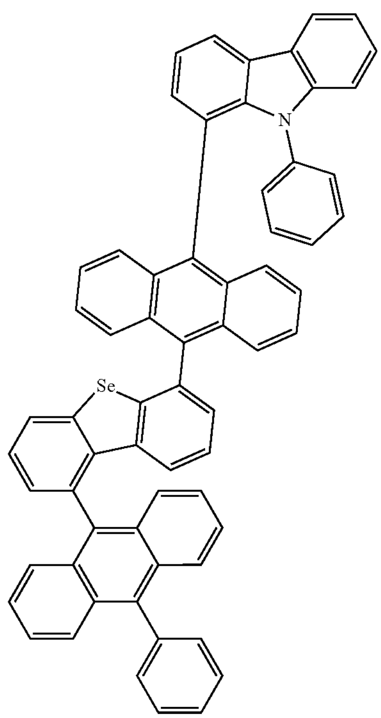
1334
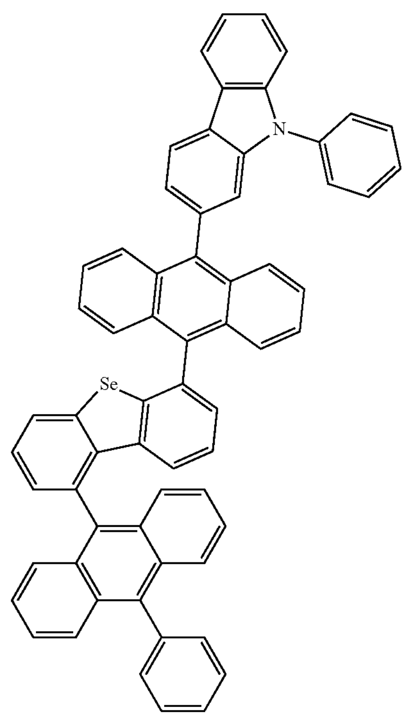
1335
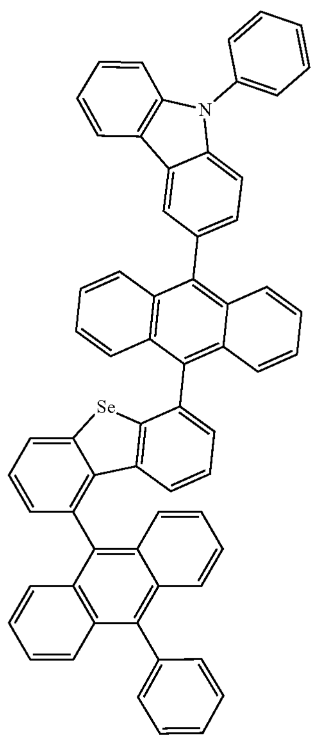
1336
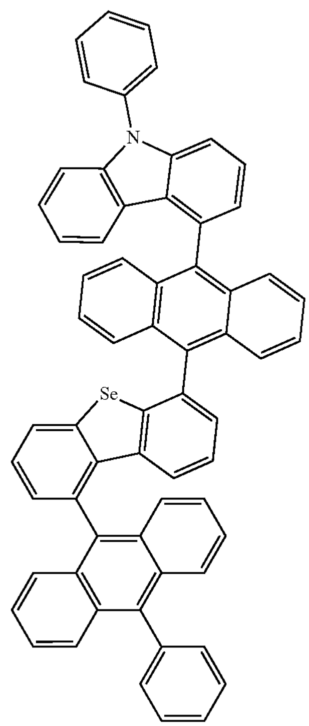

-continued
1337
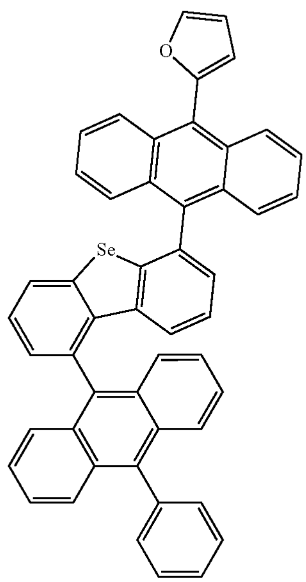
1338
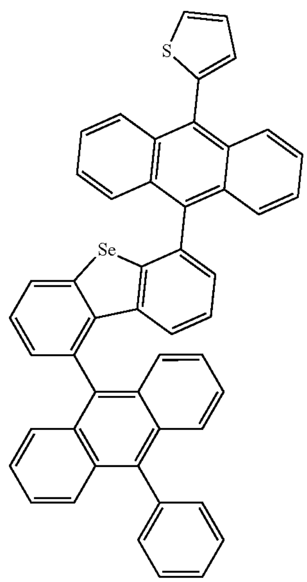
1339
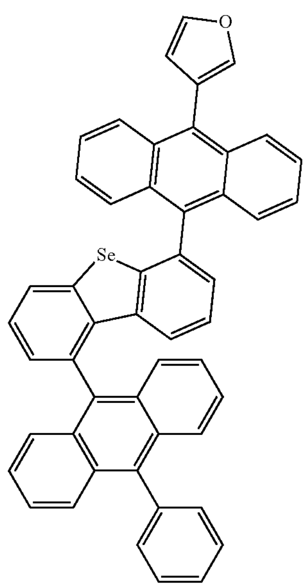
1340
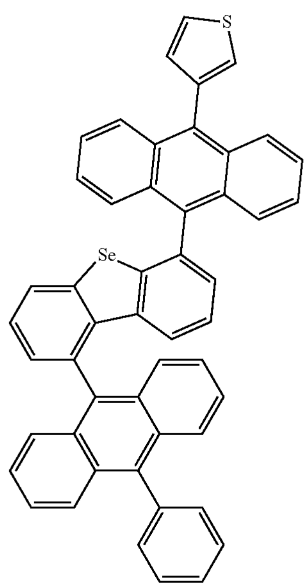

-continued
1341
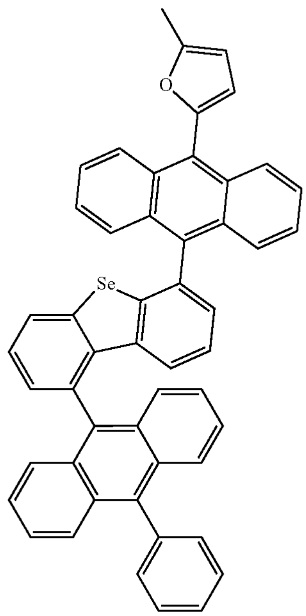
1342
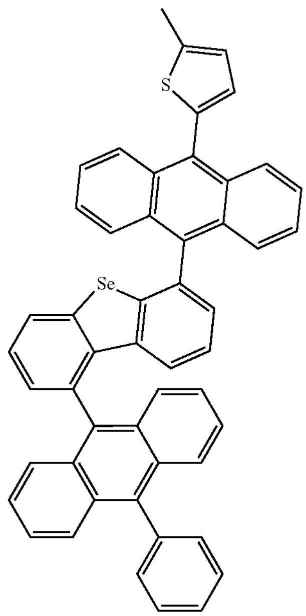
1343
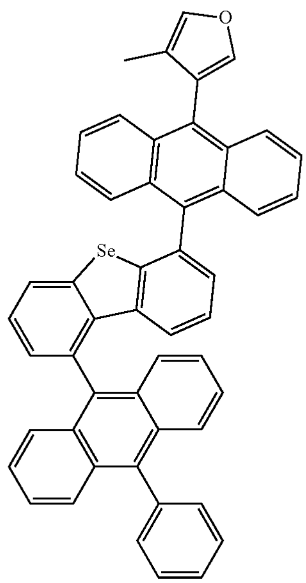
1344
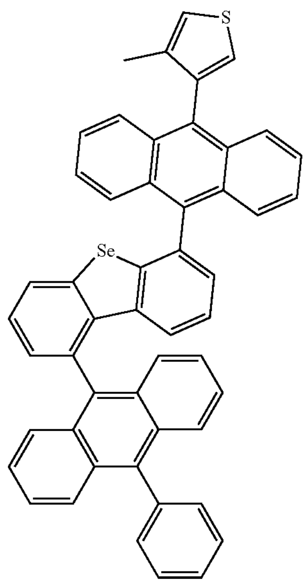
1345
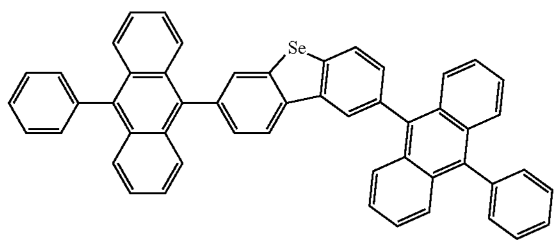
1346
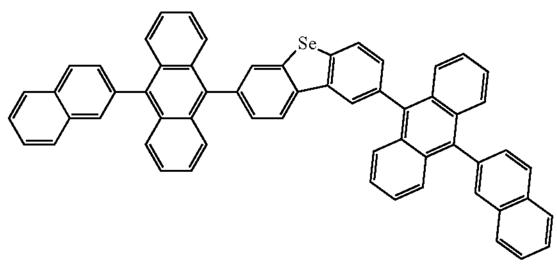

-continued
1347
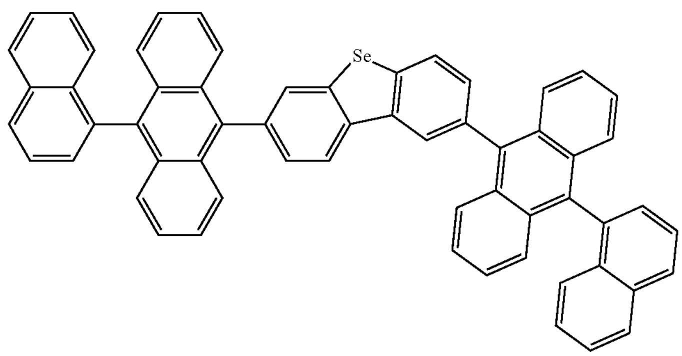
1348
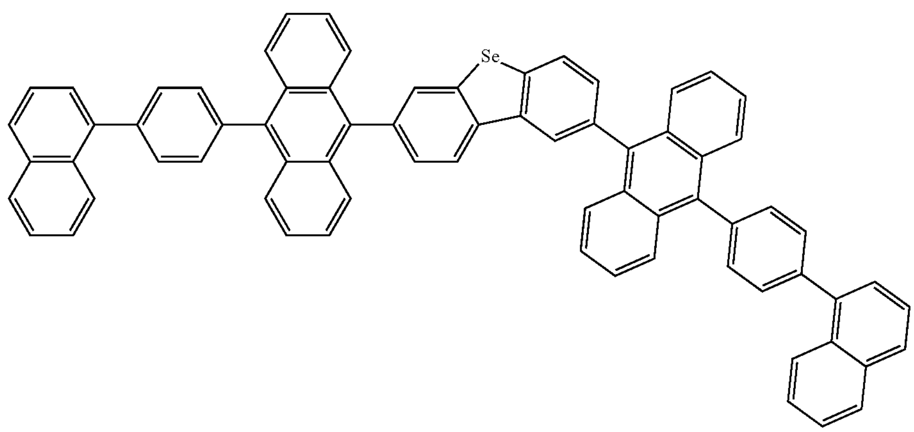
1349
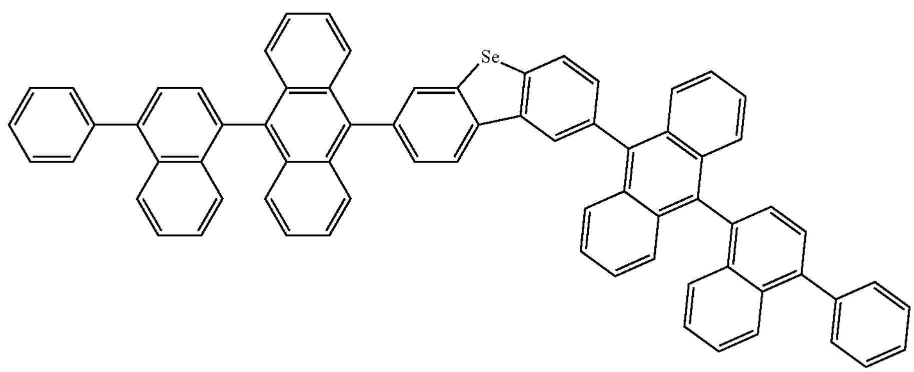
1350
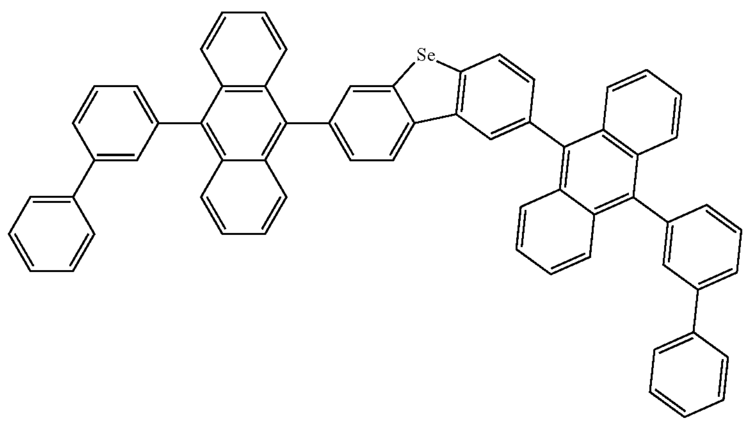

-continued
1351
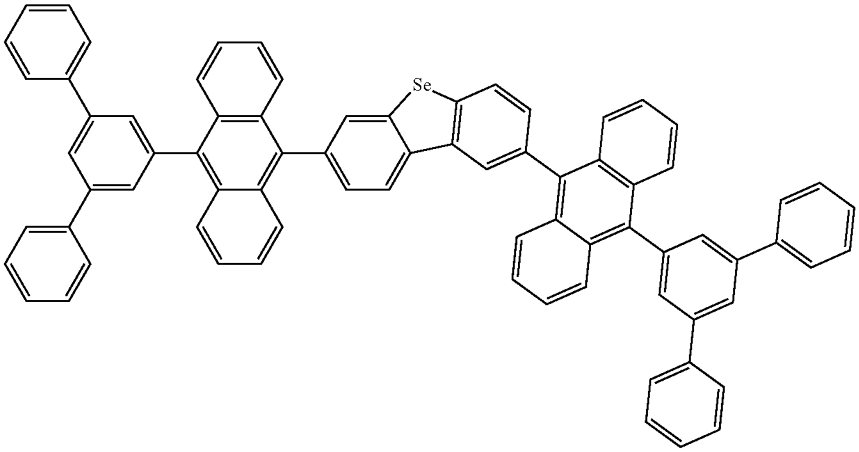
1352
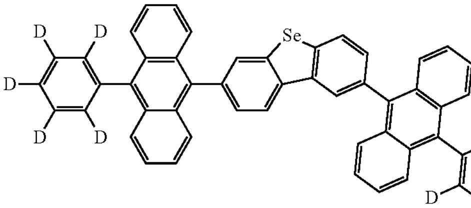
1353
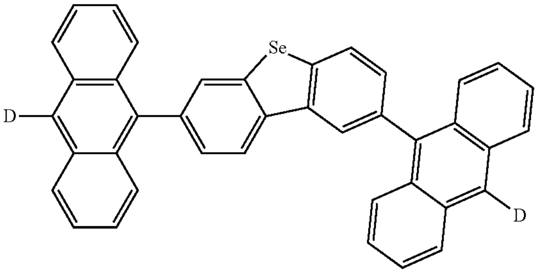
1354
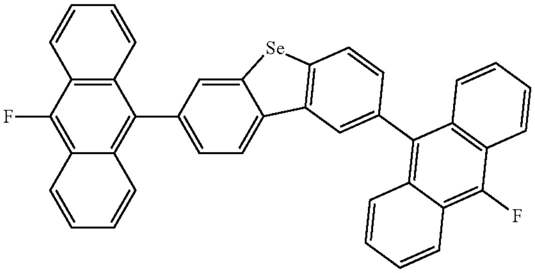
1355
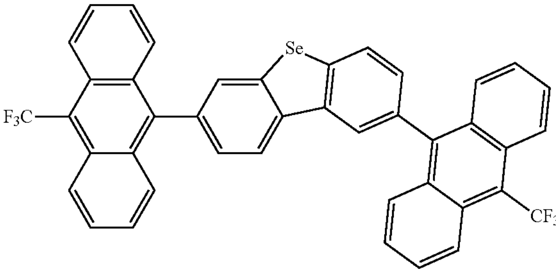
1356
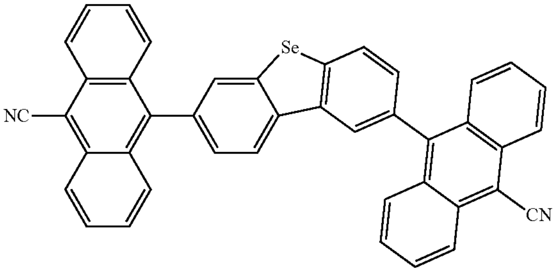
1357
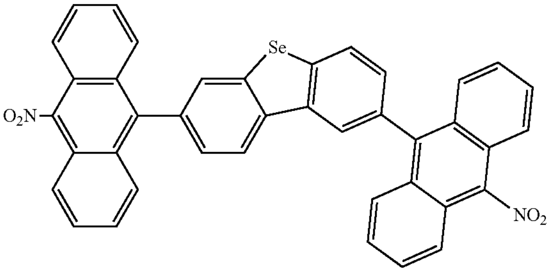
1358
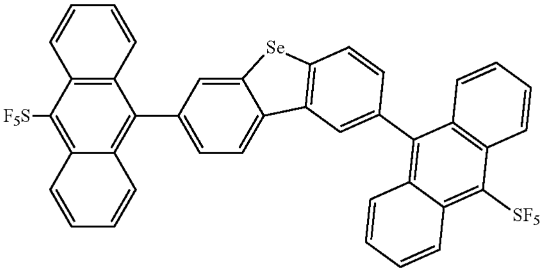
1359
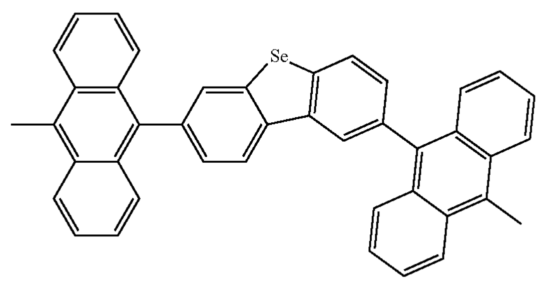

-continued
1360
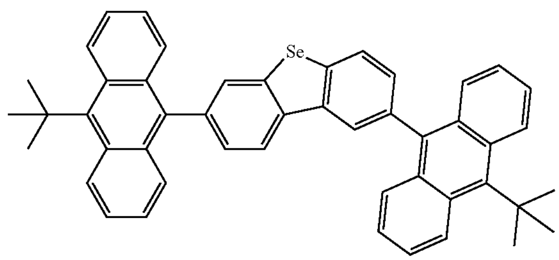
1361
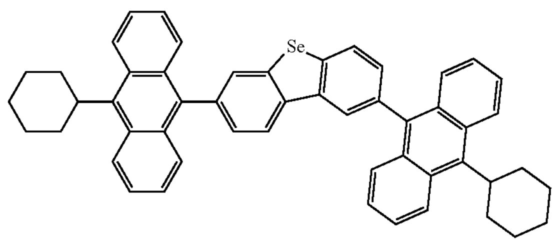
1362
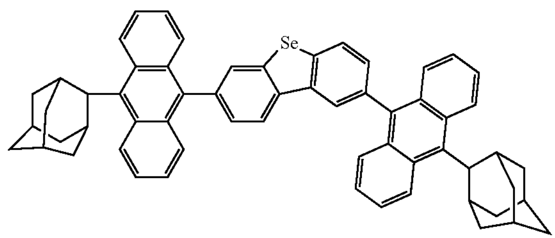
1363
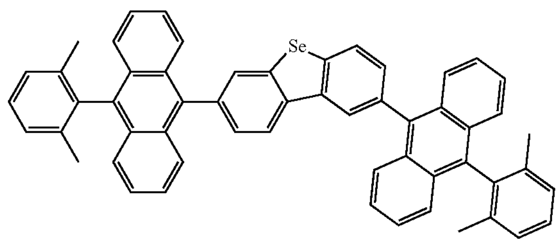
1364
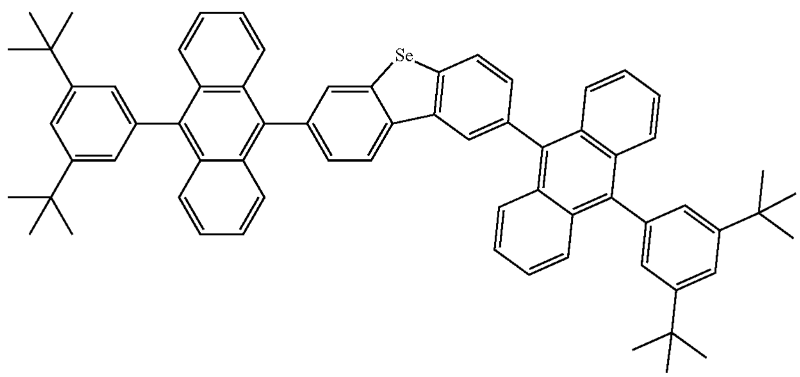
1365
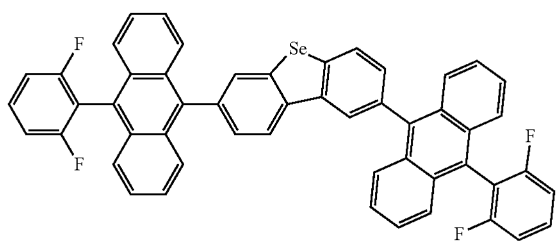
1366
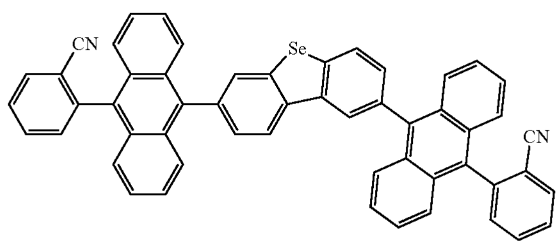
1367
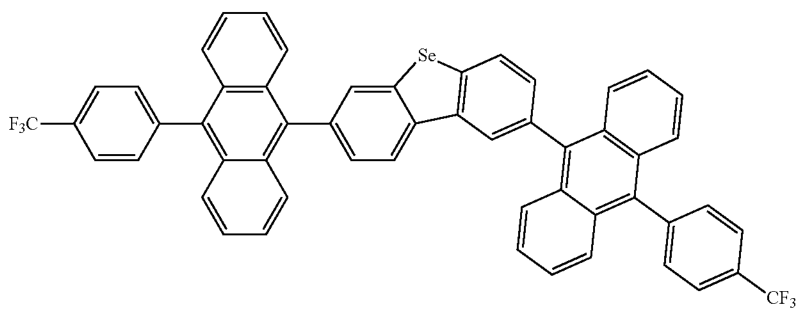

-continued
1368
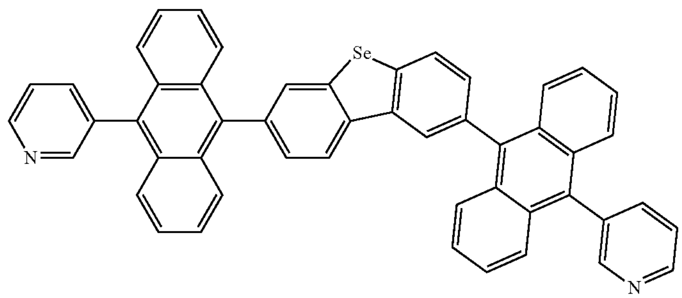
1369
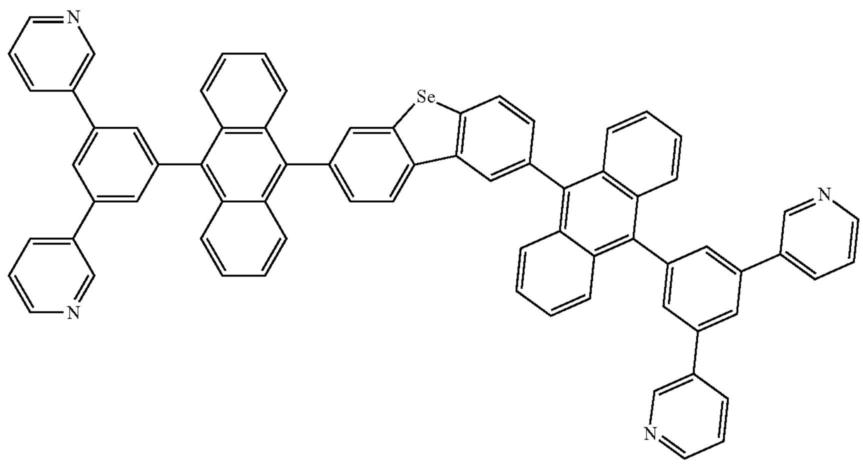
1370
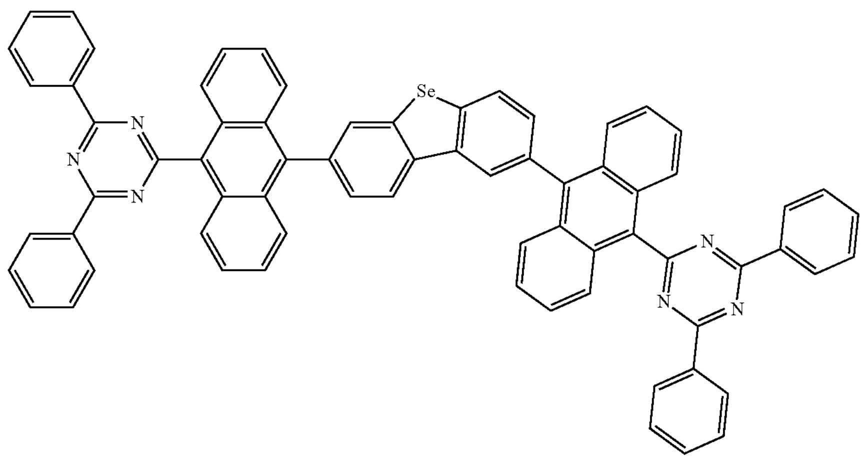
1371
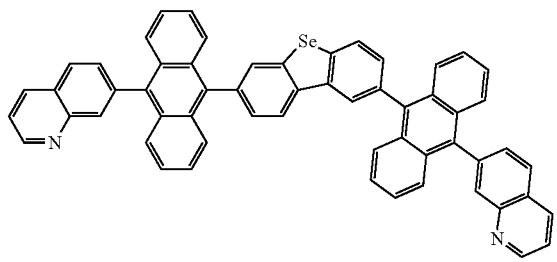
1372
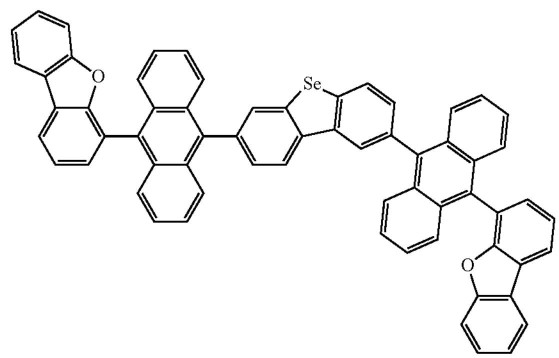

-continued
1373
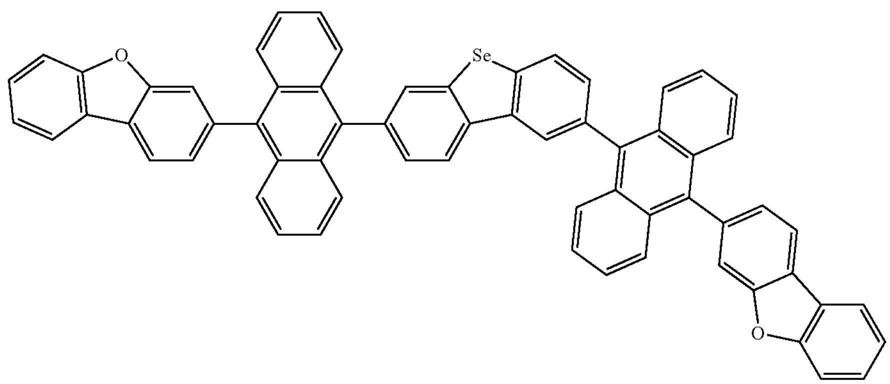
1374
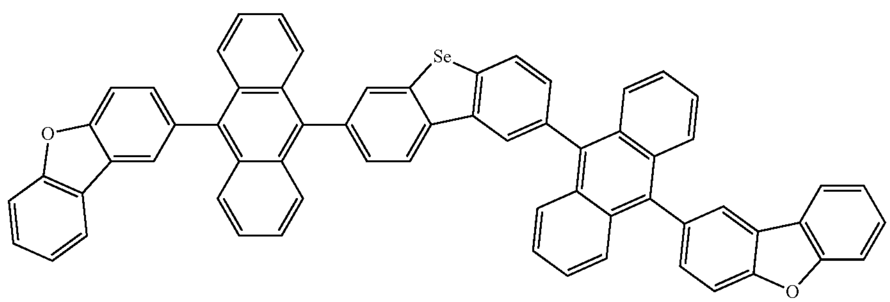
1375
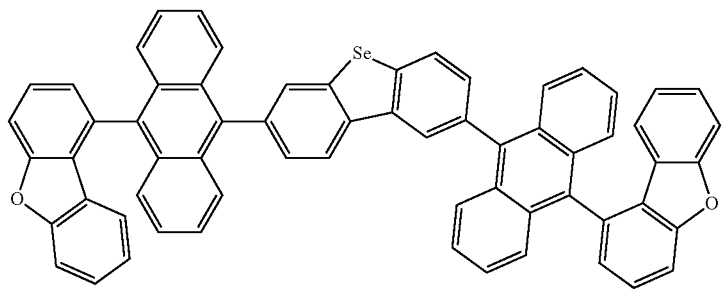
1376
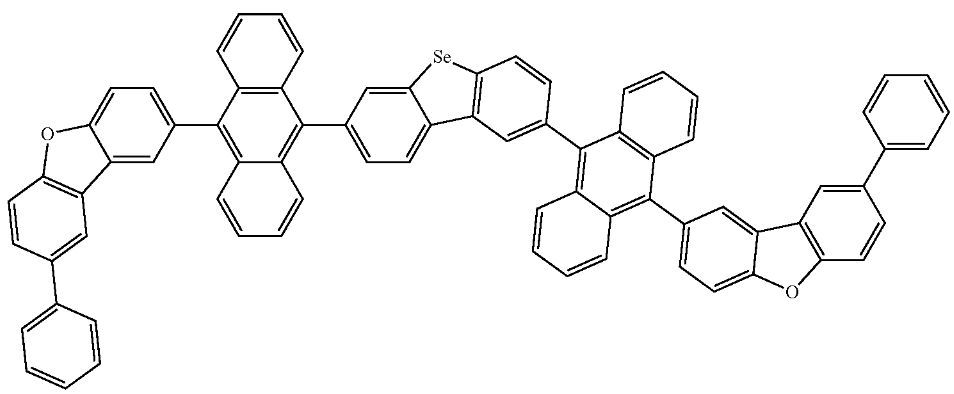

-continued
1377
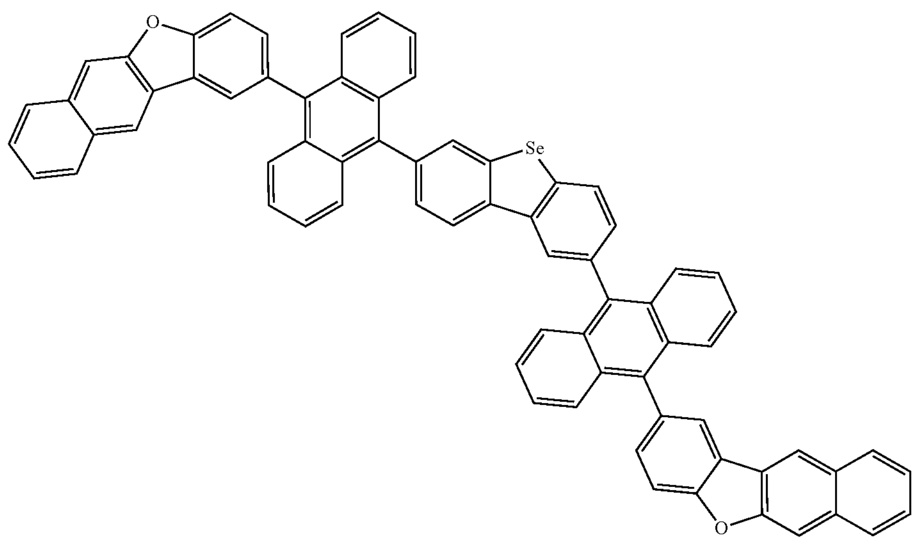
1378
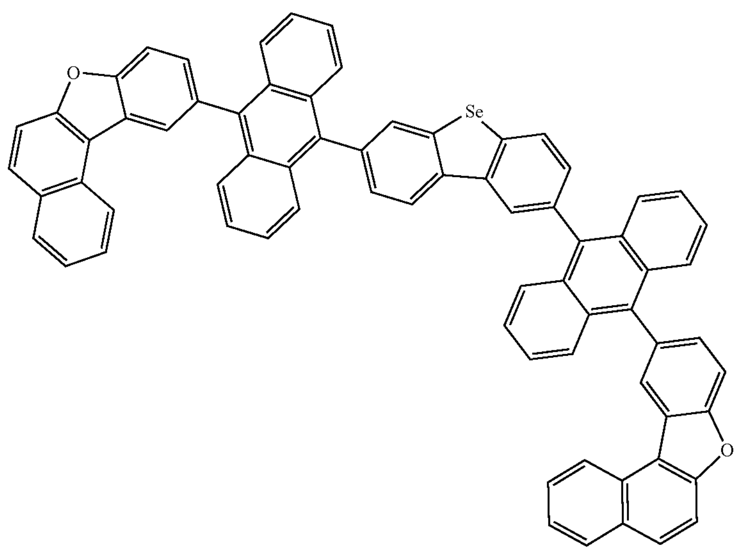
1379
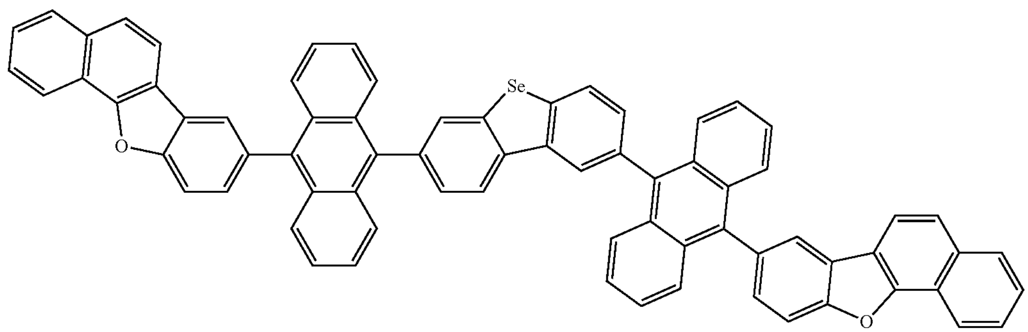

-continued
1380
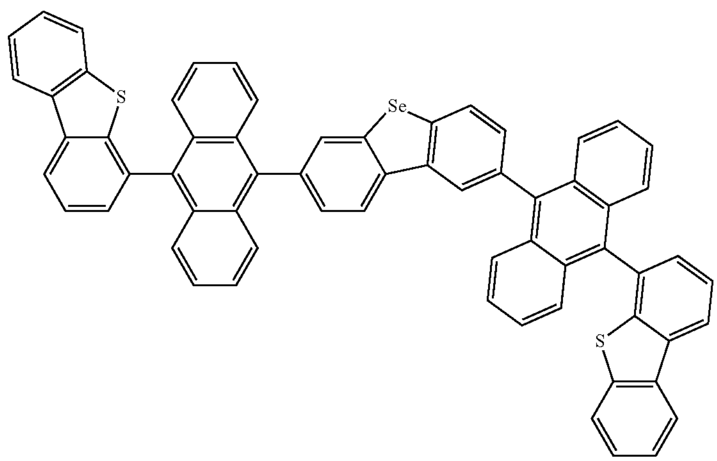
1381
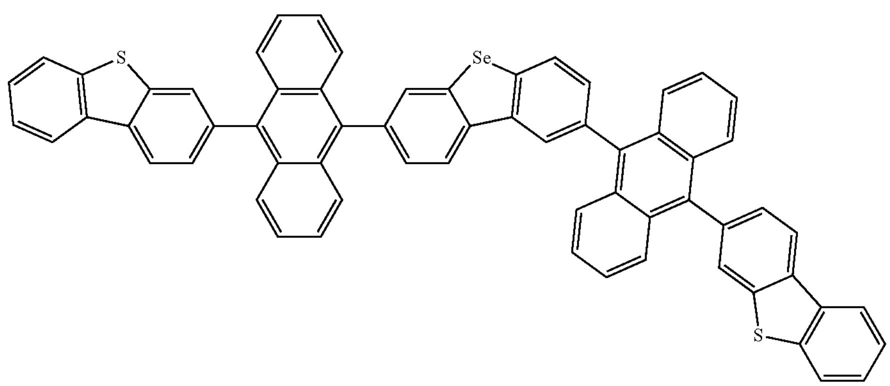
1382
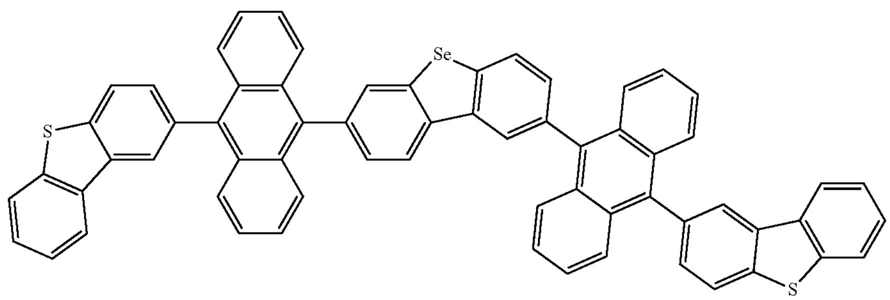
1383
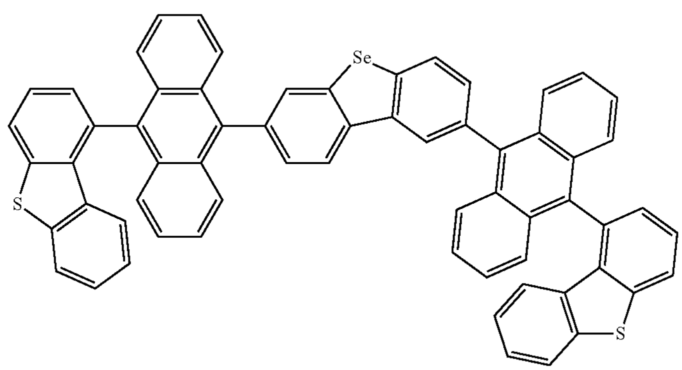

-continued
1384
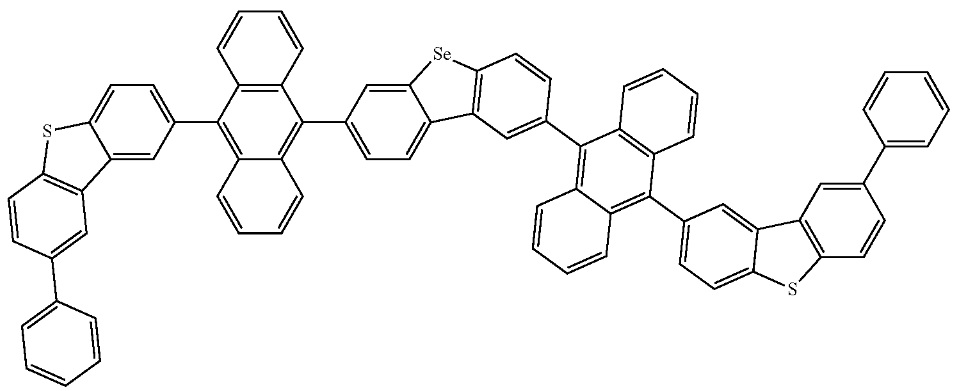
1385
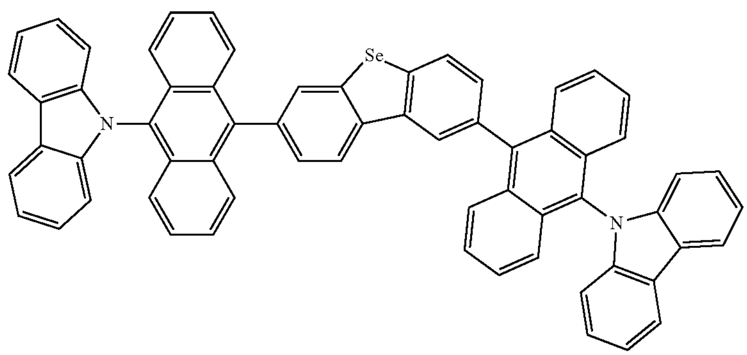
1386
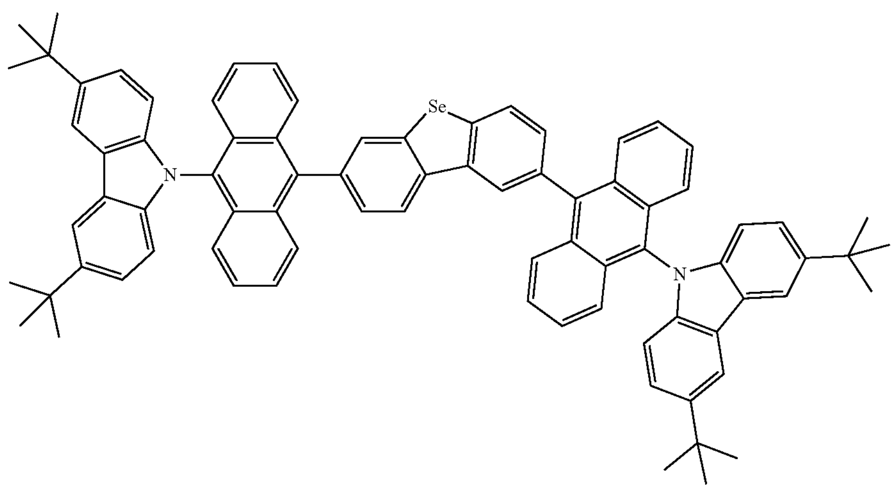

-continued
1387
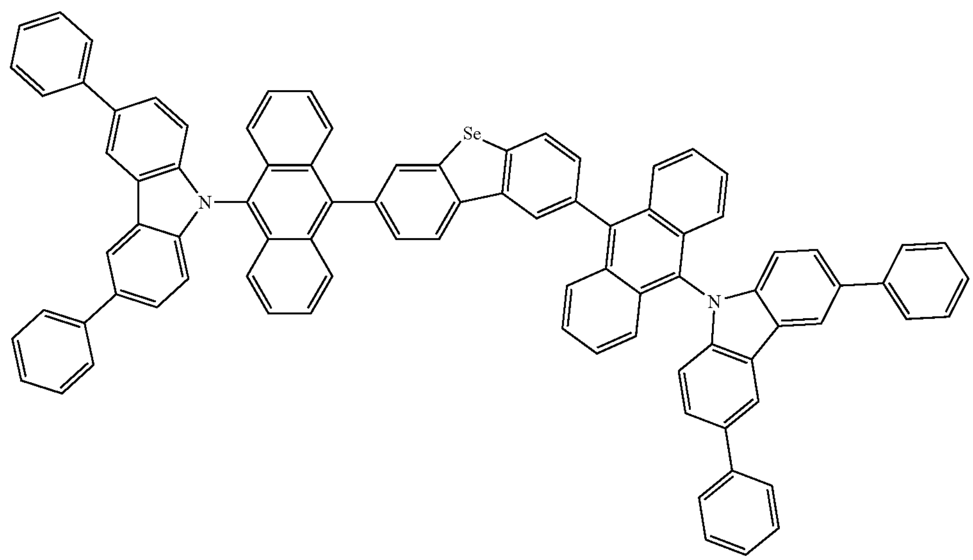
1388
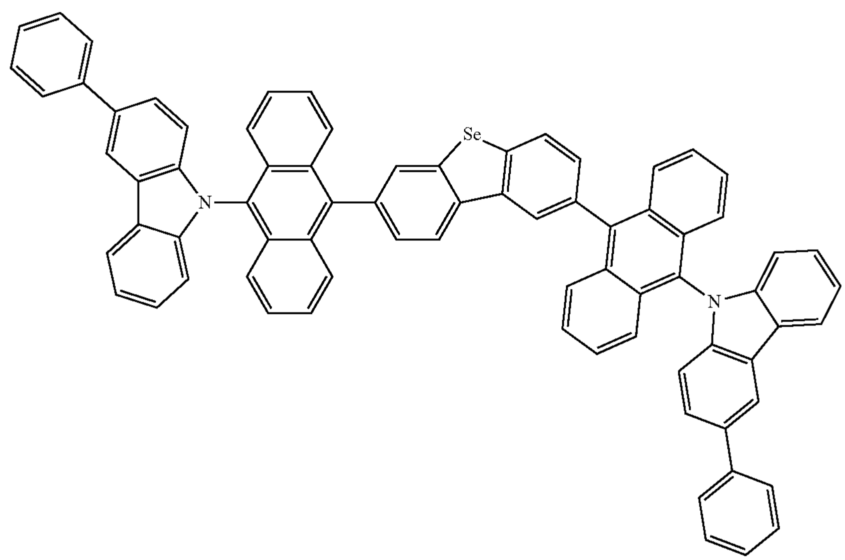
1389
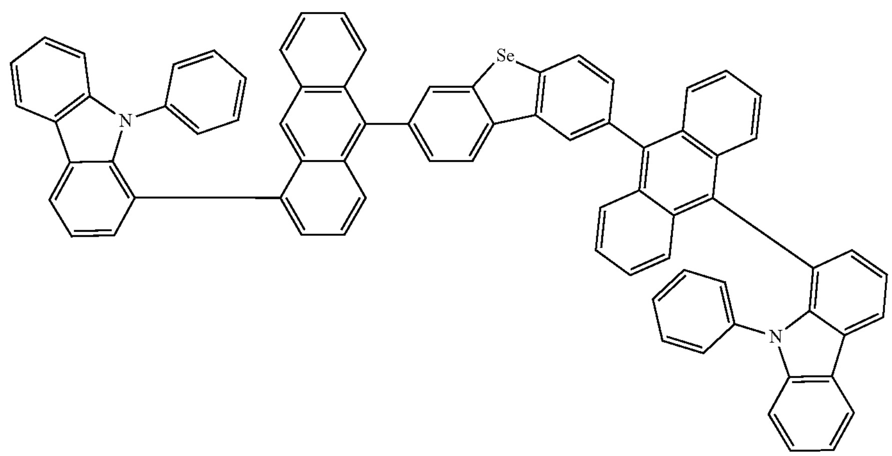

-continued
1390
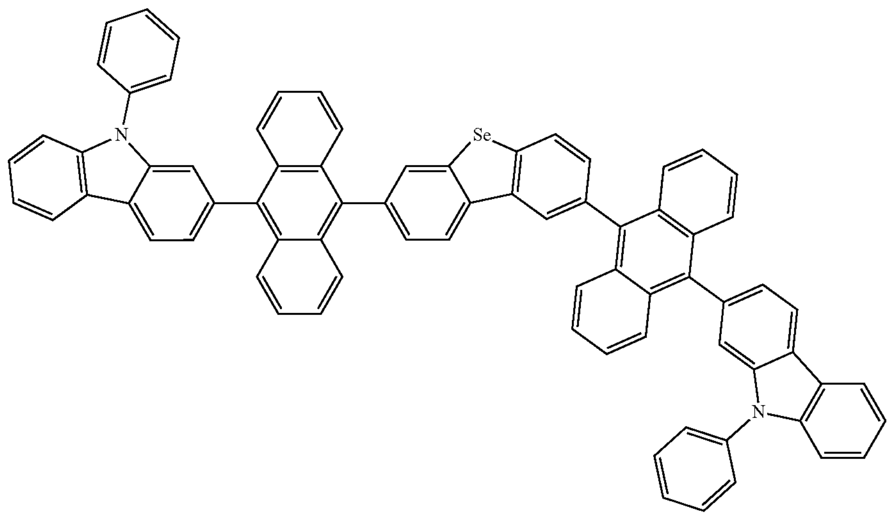
1391
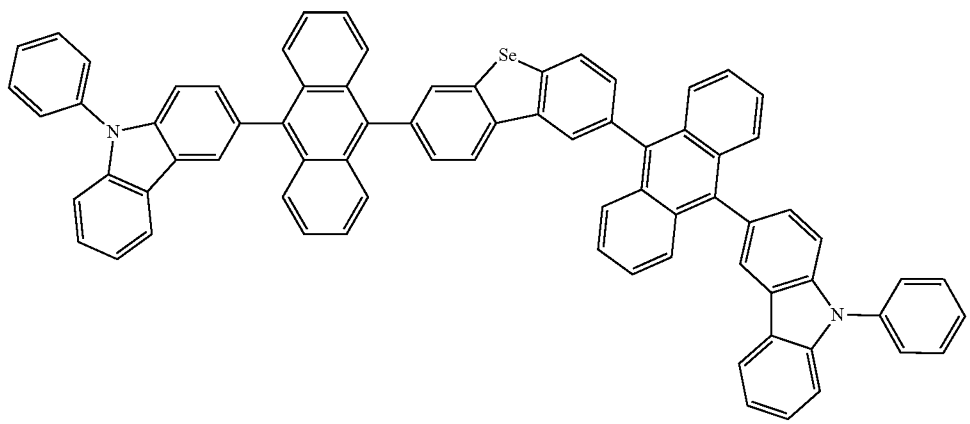
1392
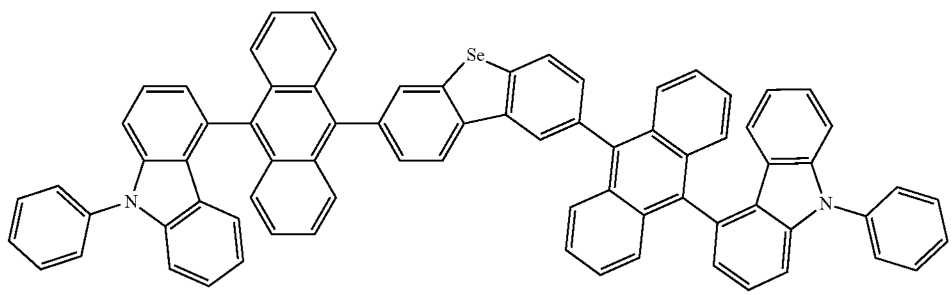
1393
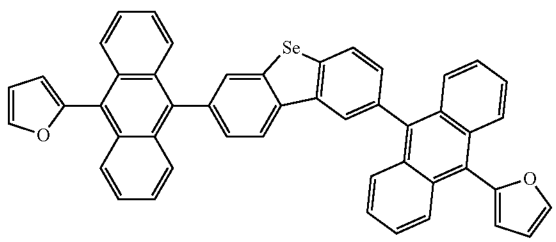
1394
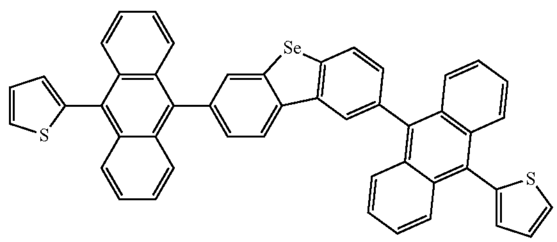

-continued
1395
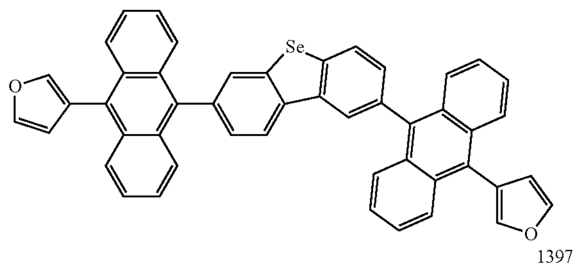
1396
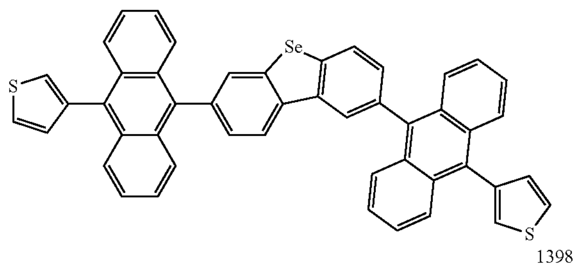
1397
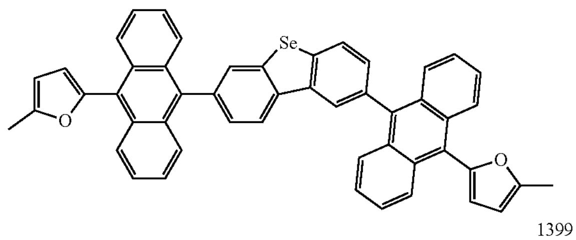
1398
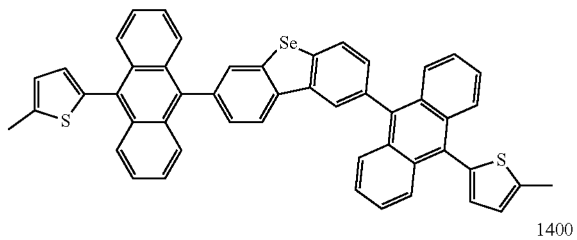
1399
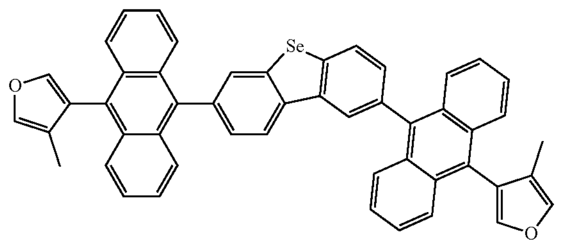
1400
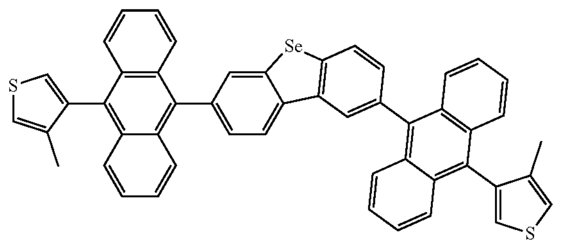
1401
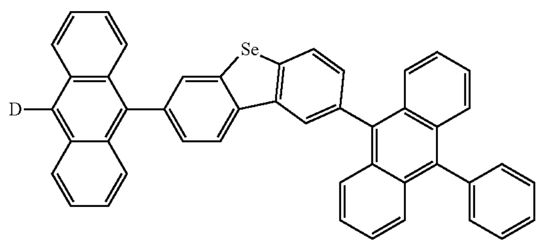
1402
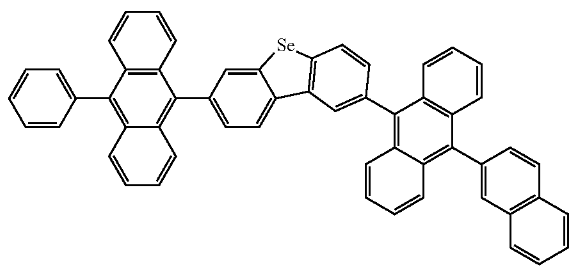
1403
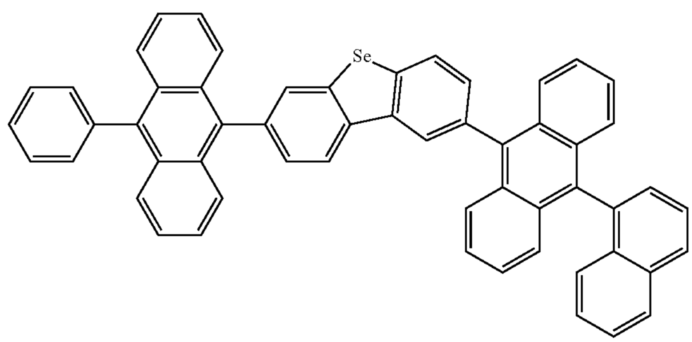

-continued
1404
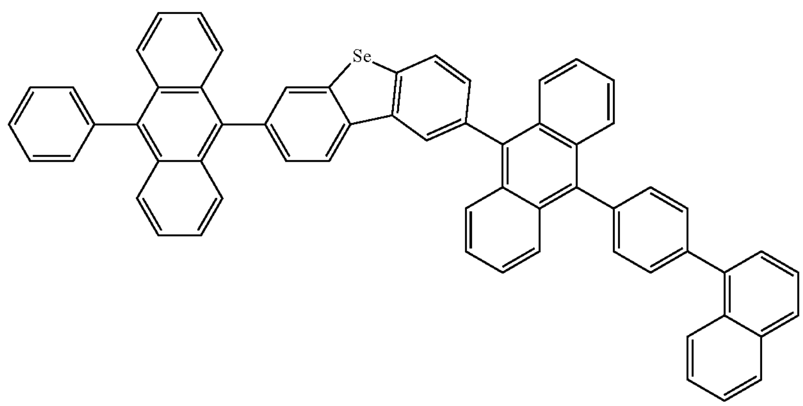
1405
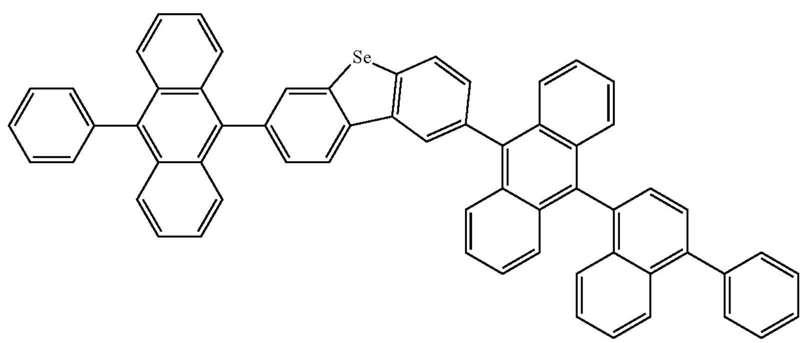
1406
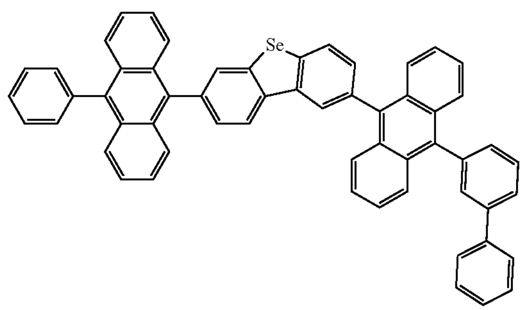
1407
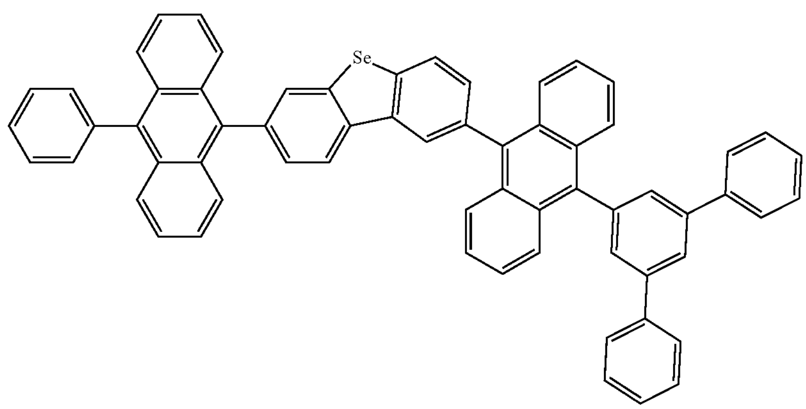

-continued
1408
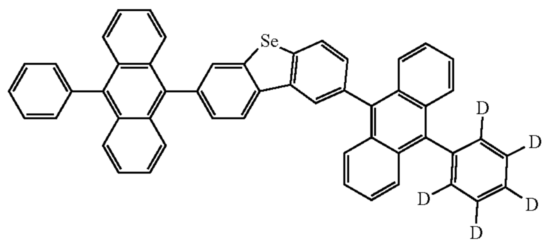
1409
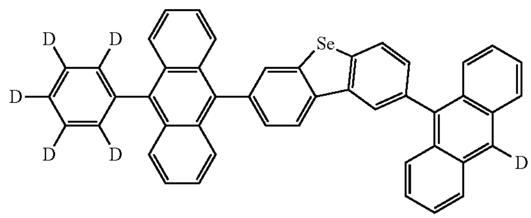
1410
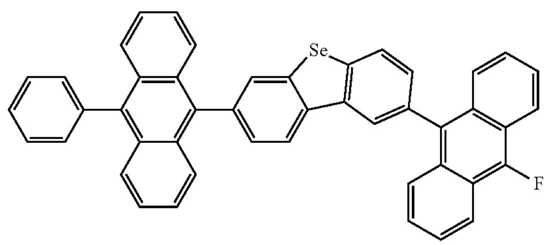
1411
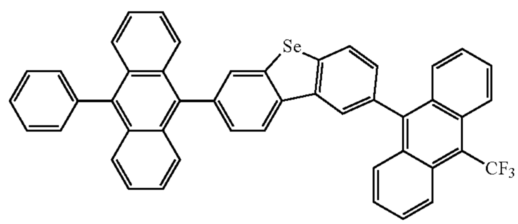
1412
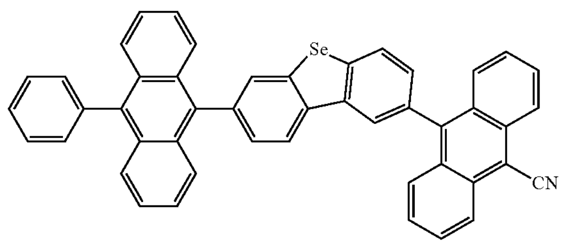
1413
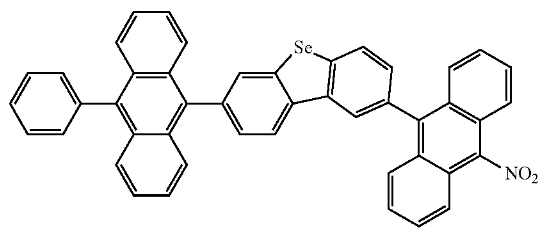
1414
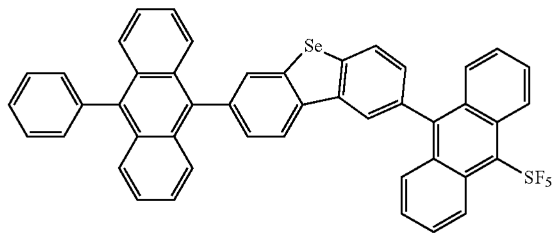
1415
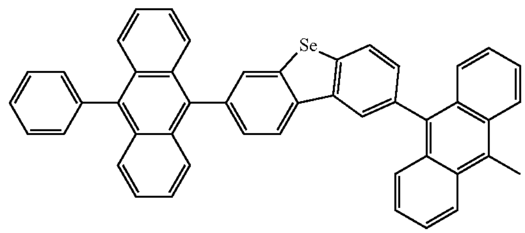
1416
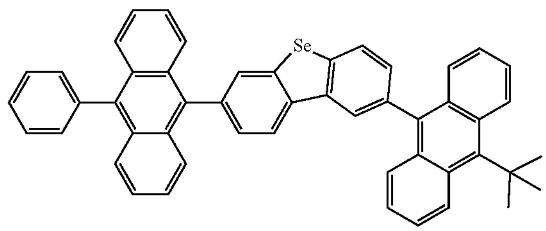
1417
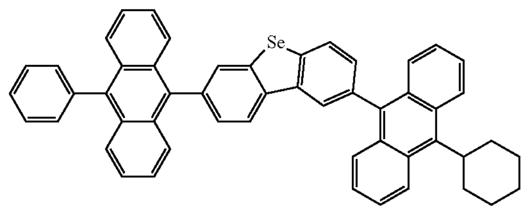
1418
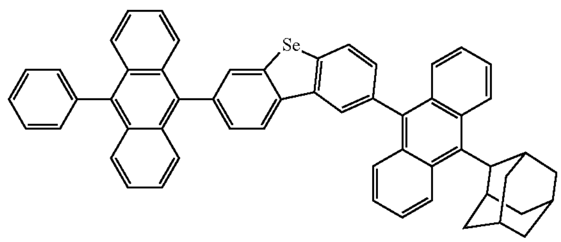
1419
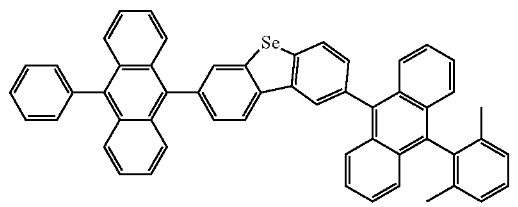

-continued
1420
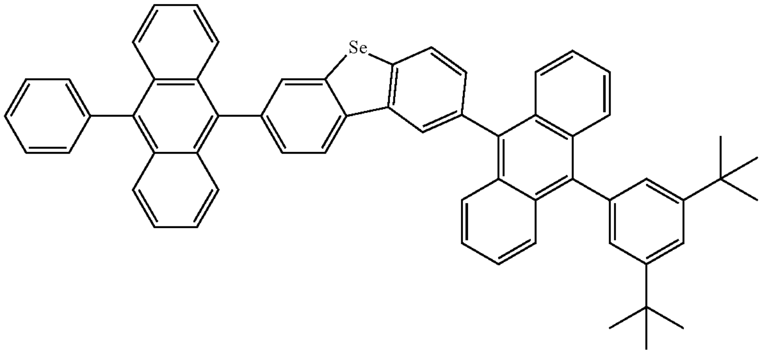
1421 
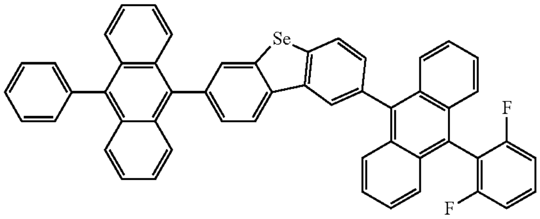
1422
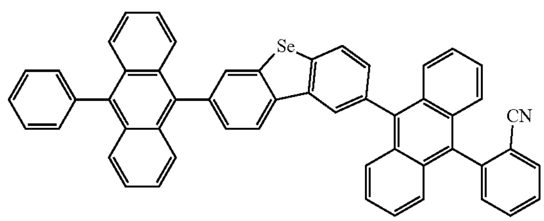
1423
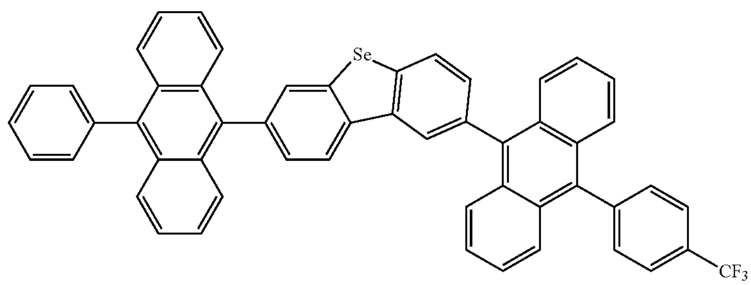
1424
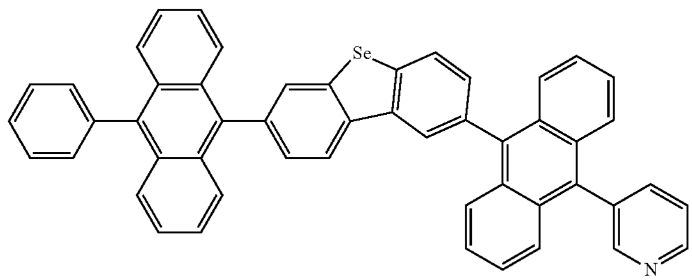
1425
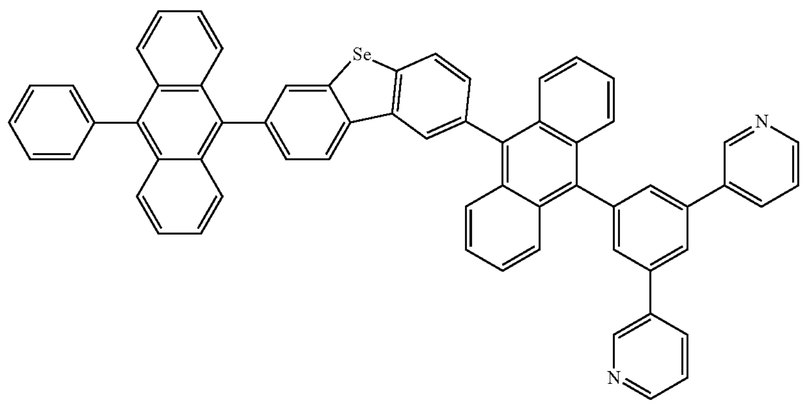

-continued
1426
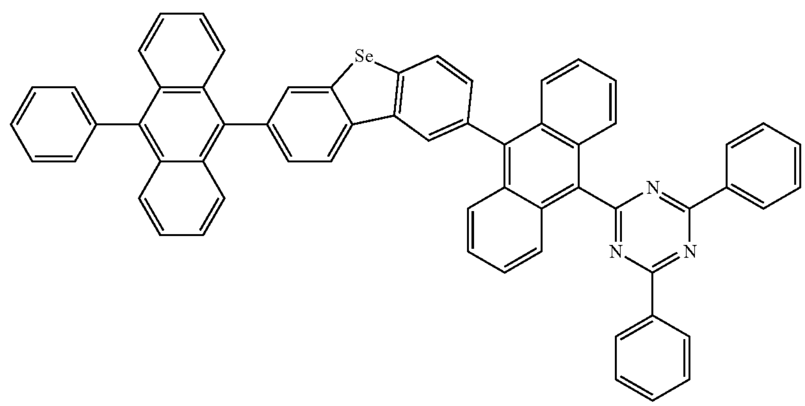
1427
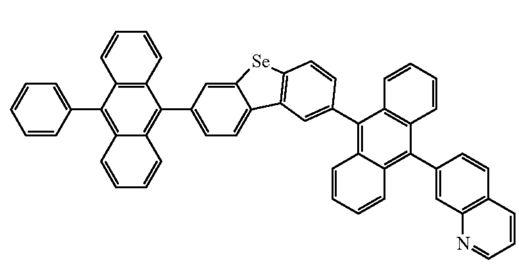
1428
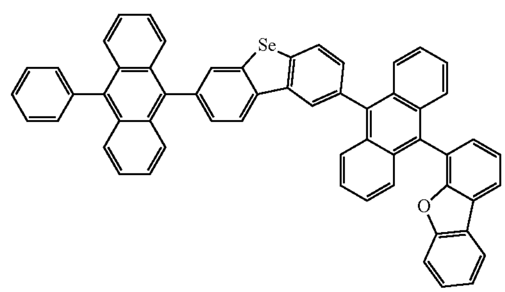
1429
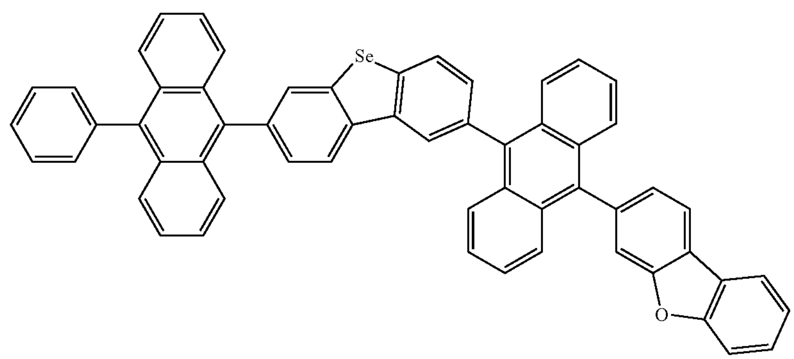
1430
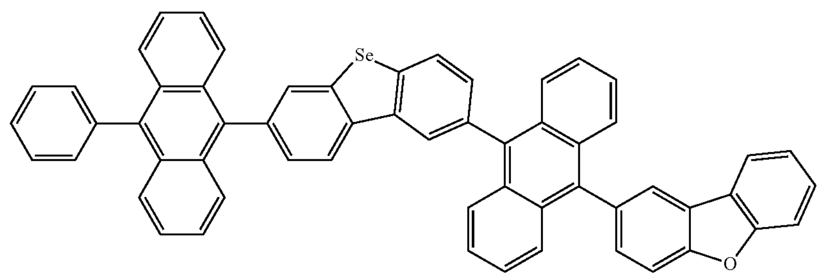

-continued
1431
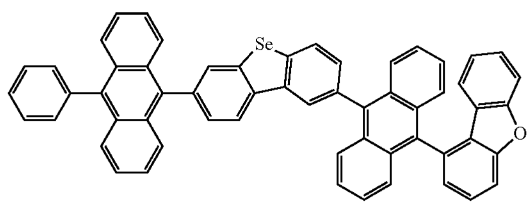
1432
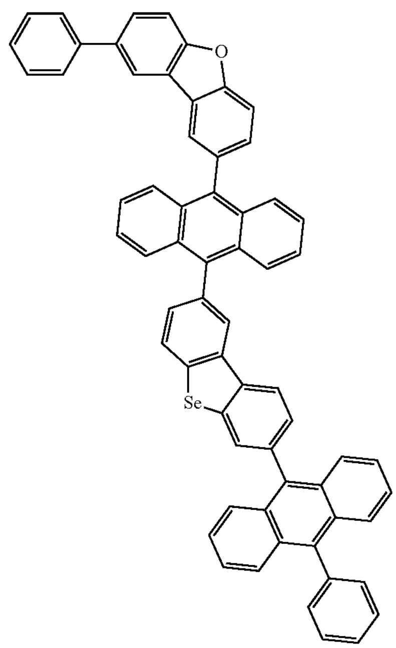
1433
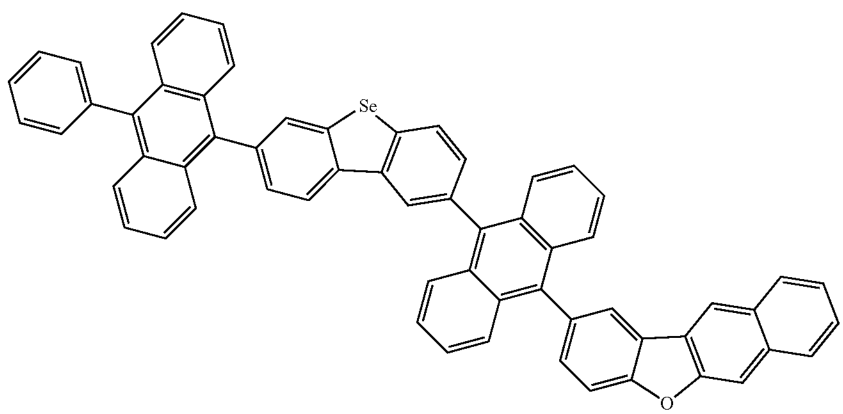
1434
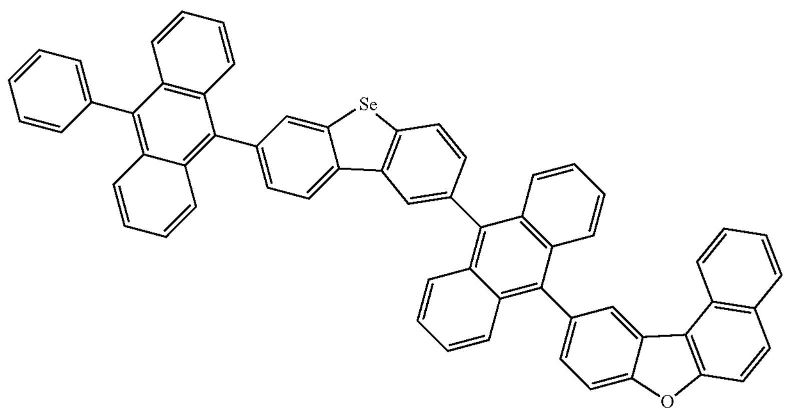

-continued
1435
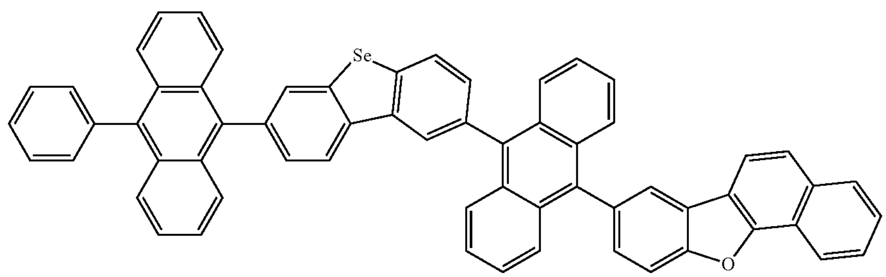
1436
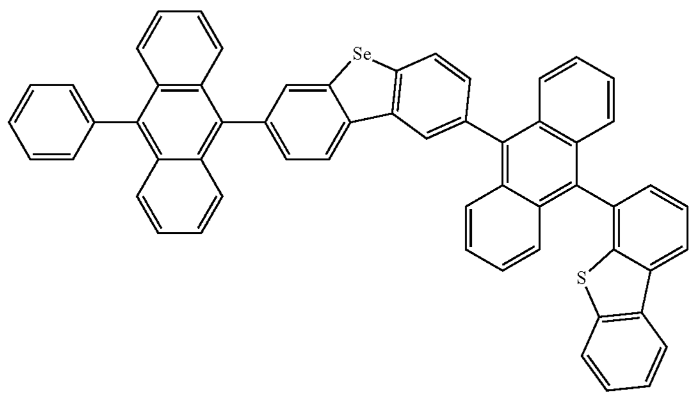
1437
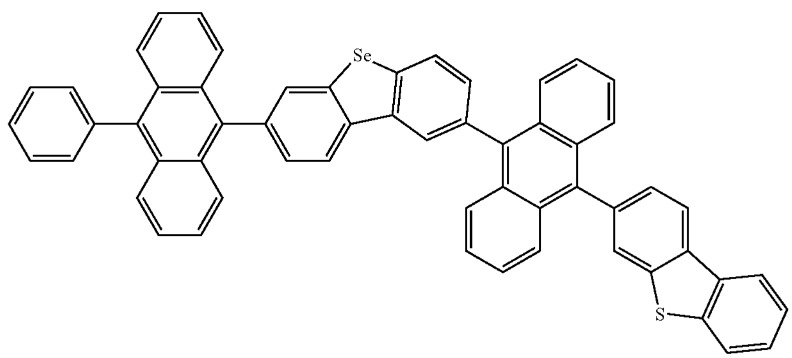
1438
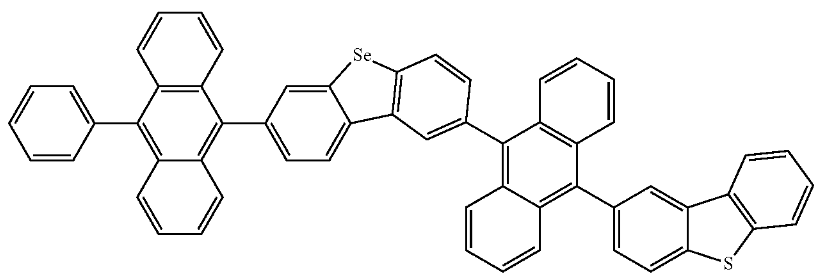

-continued
1439
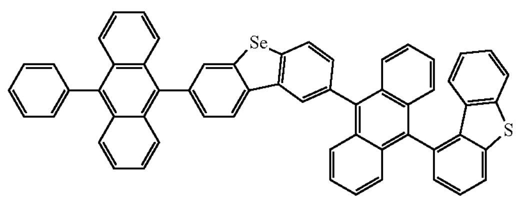
1440
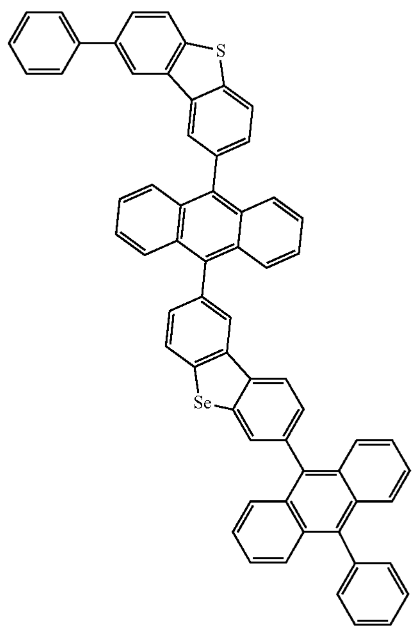
1441
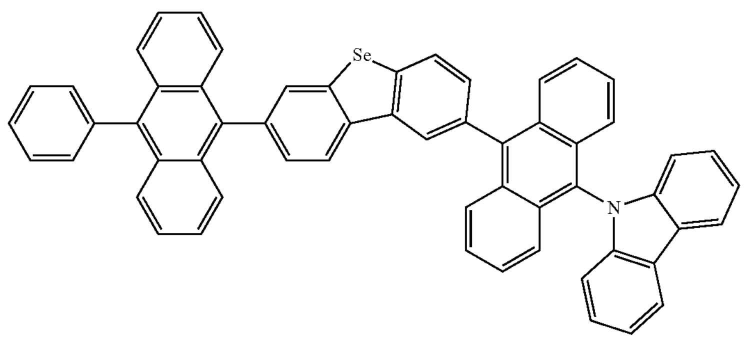
1442
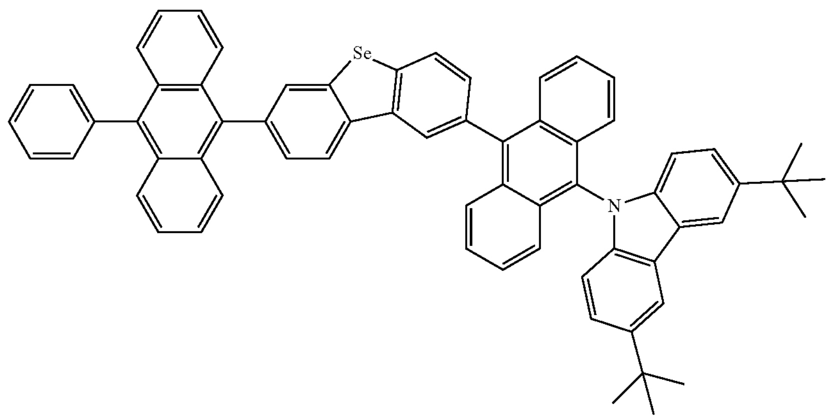

-continued
1443
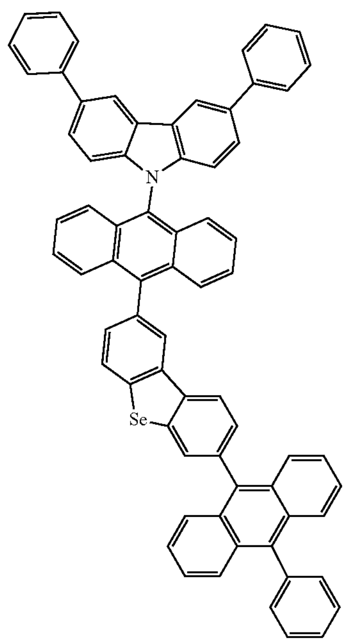
1444
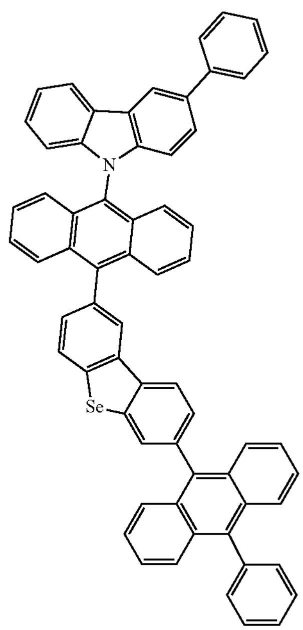
1445
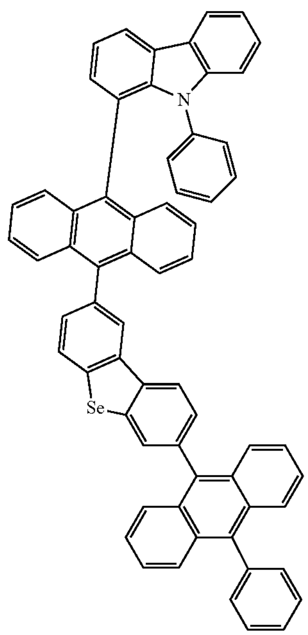
1446
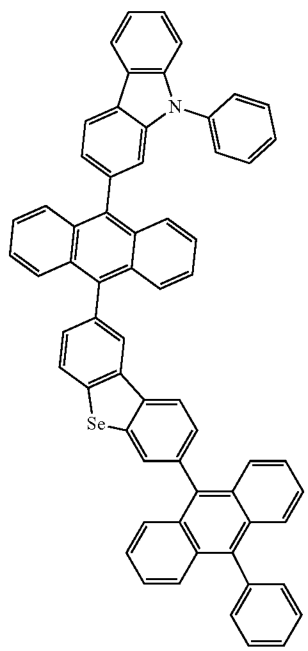

-continued
1447
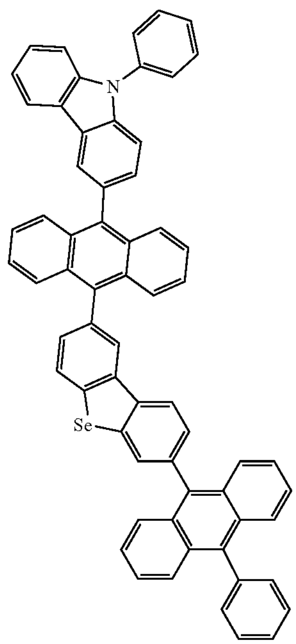
1448
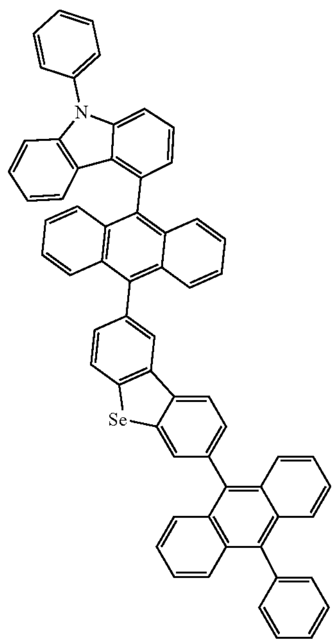
1449
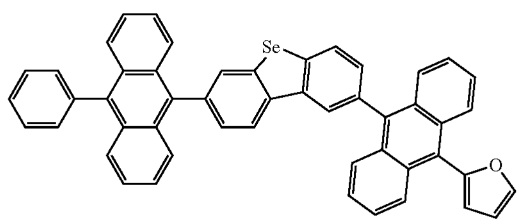
1450
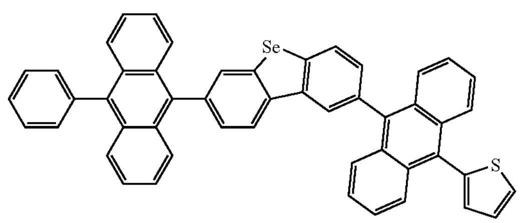
1451
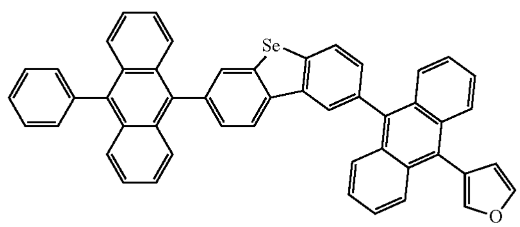
1453
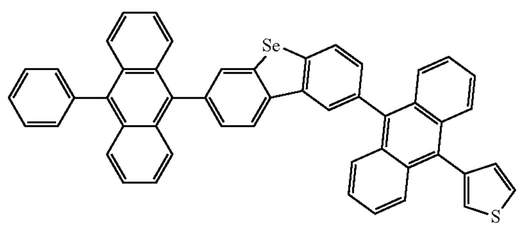
1453
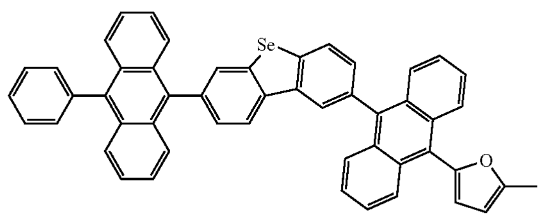
1454
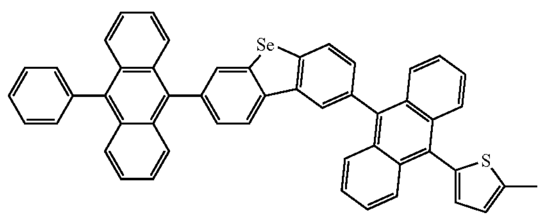
1455
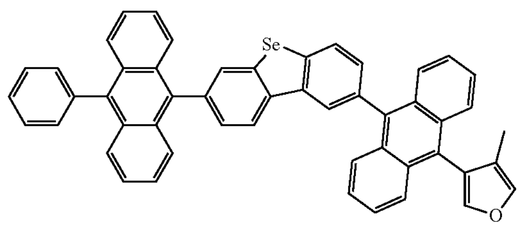
1456
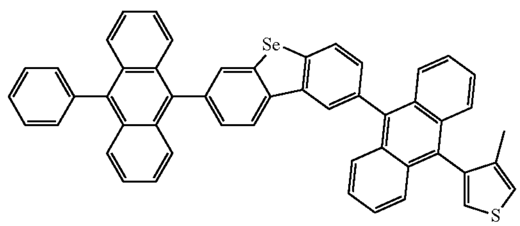

-continued
1457
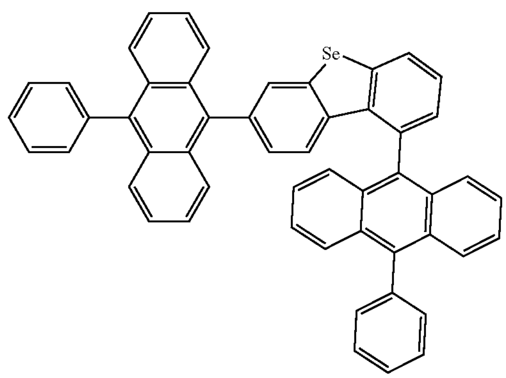
1458
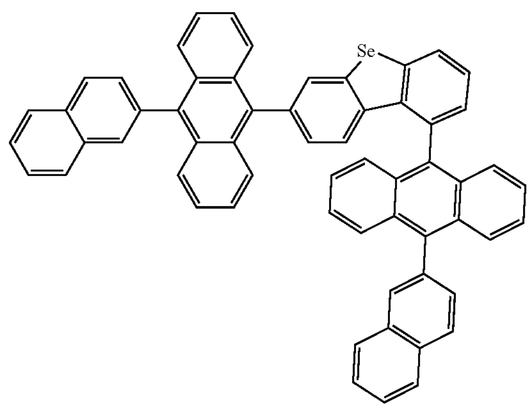
1459
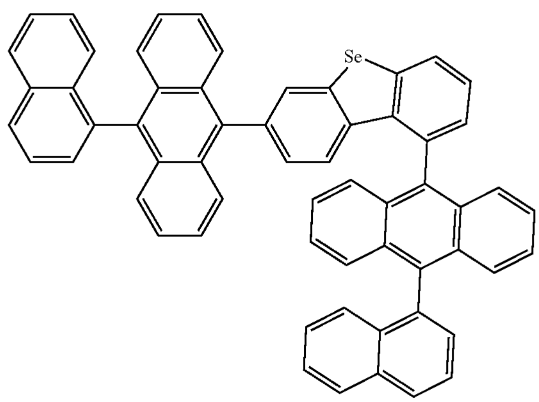
1460
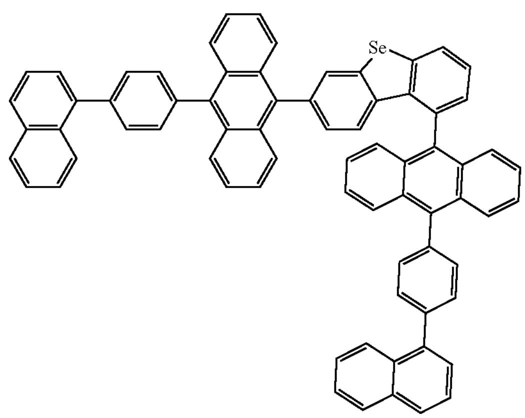
1461
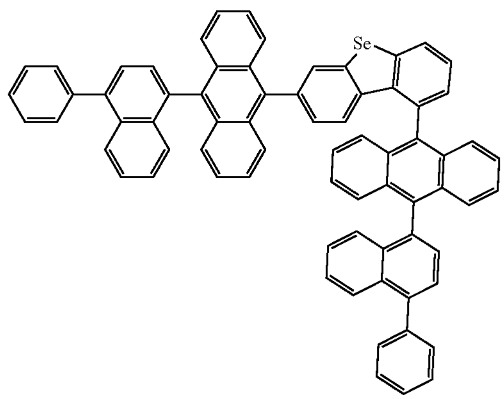
1462
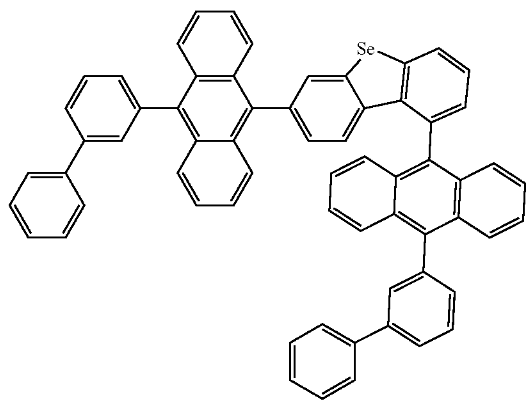

-continued
1463
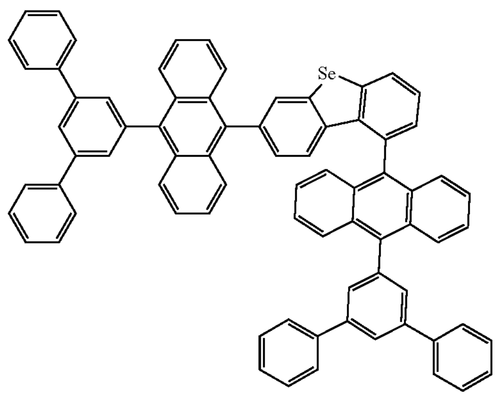
1464
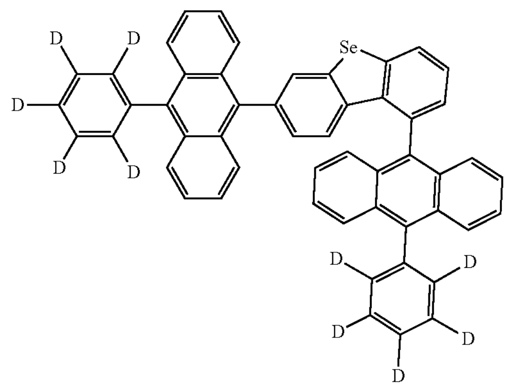
1465
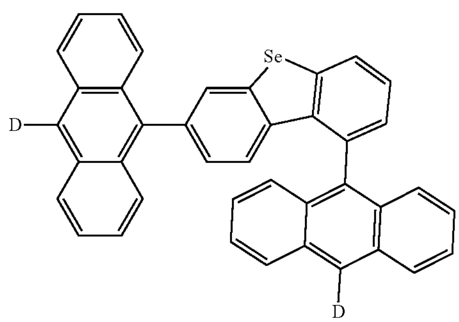
1466
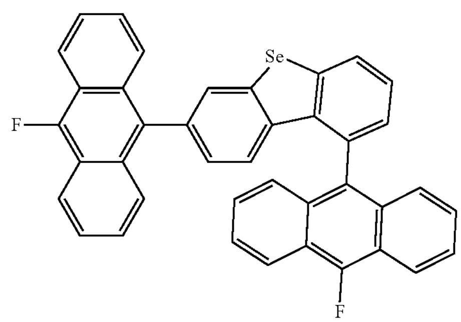
1467
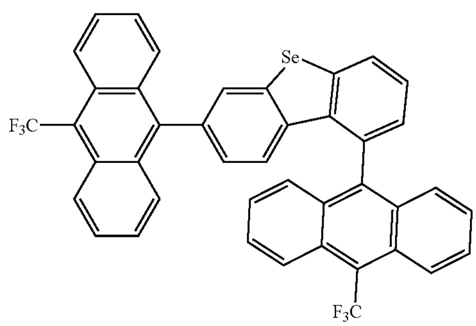
1468
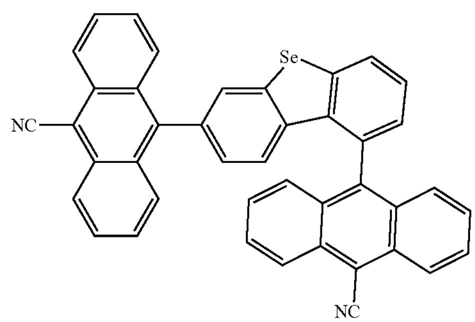
1469
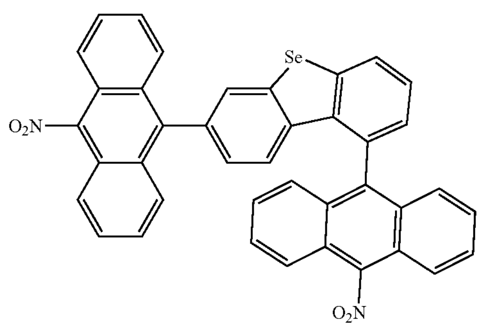
1470
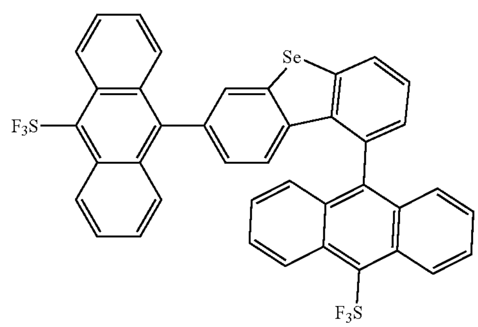

-continued
1471
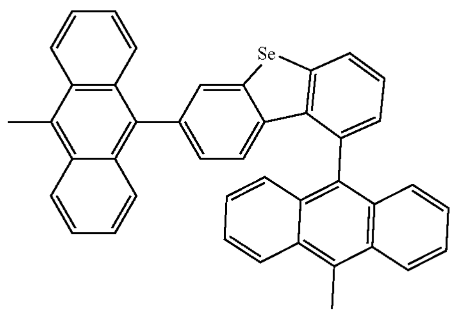
1472
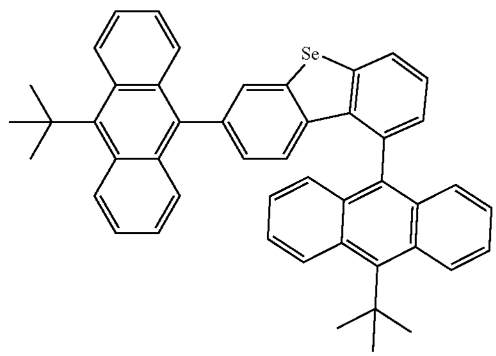
1473
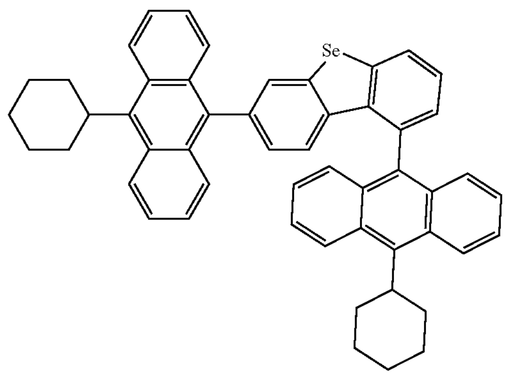
1474
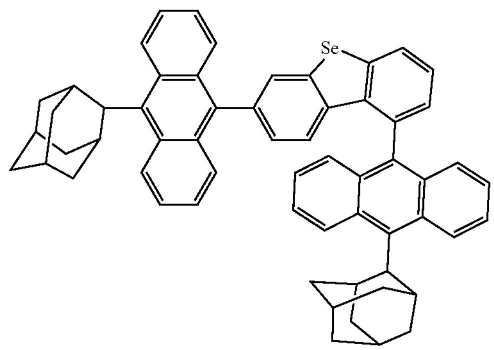
1475
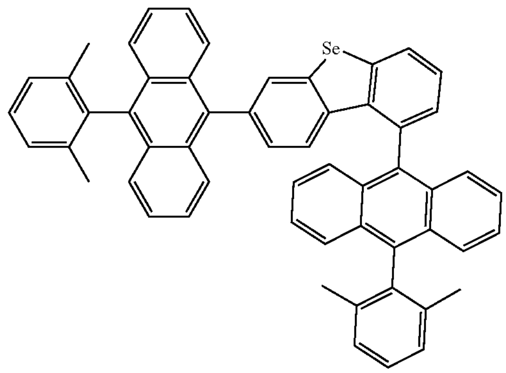
1476
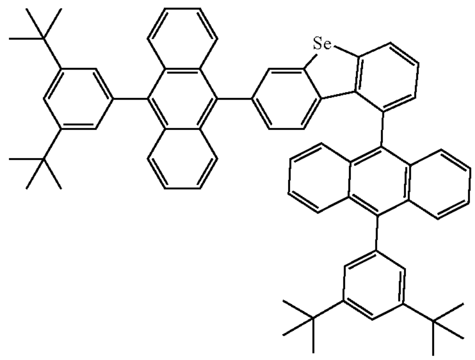
1477
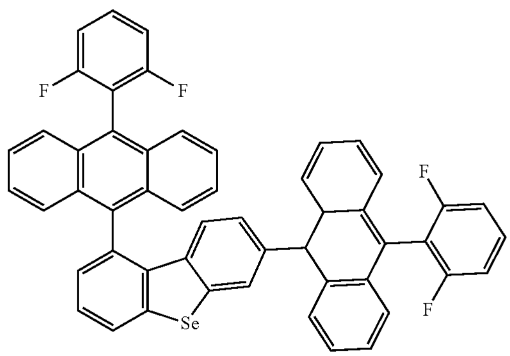
1478
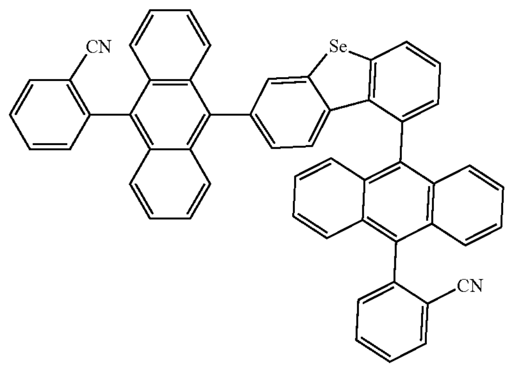

-continued
1479
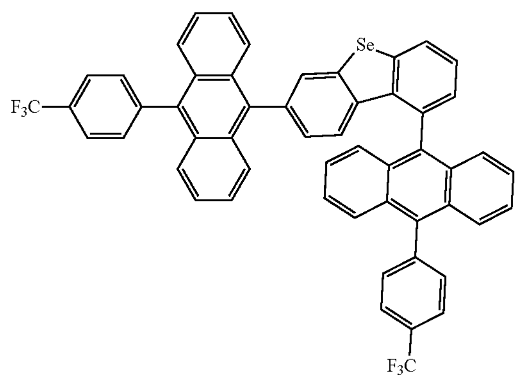
1480
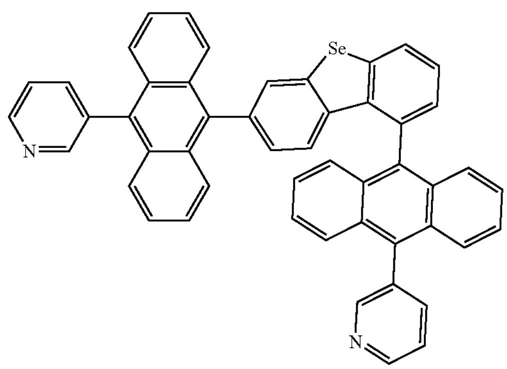
1481
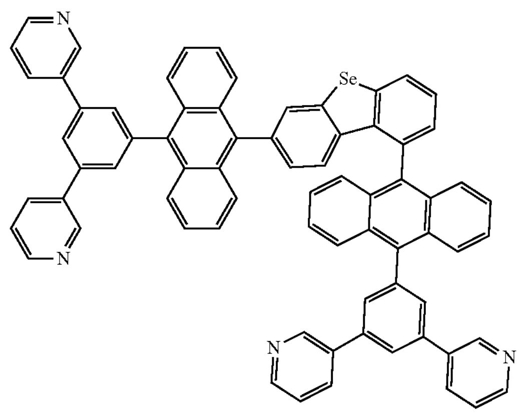
1482
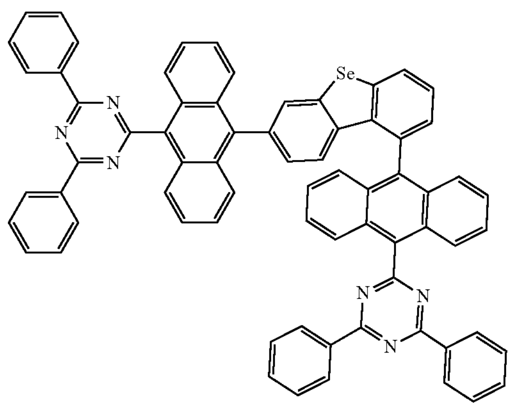
1483
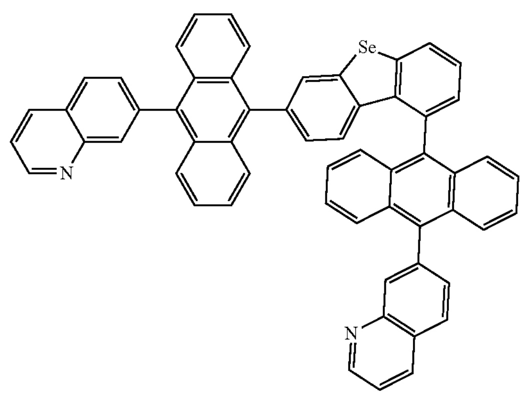
1484
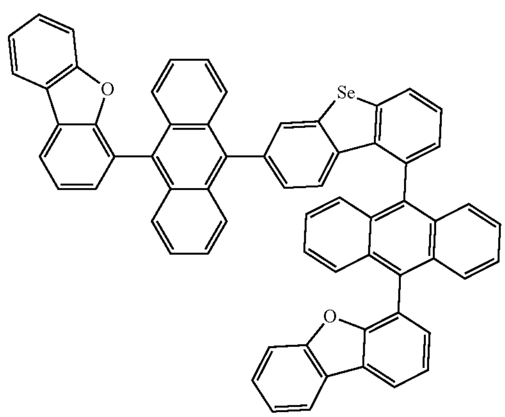
1485
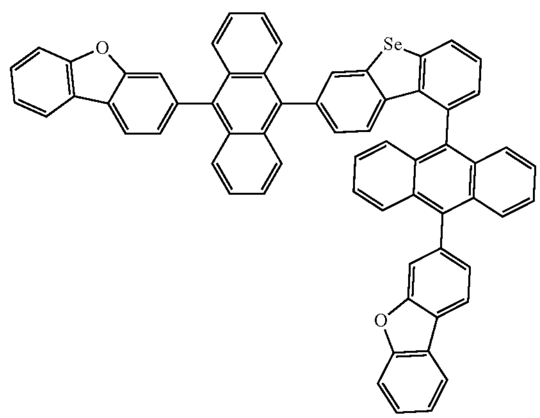
1486
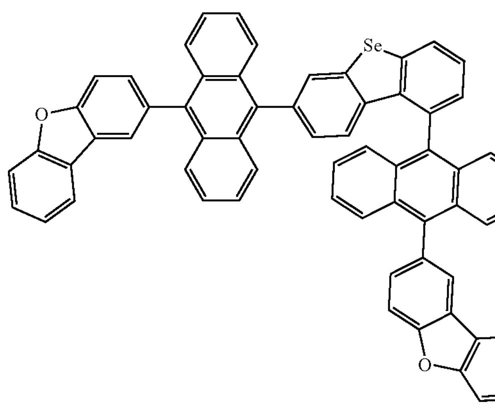

-continued
1487
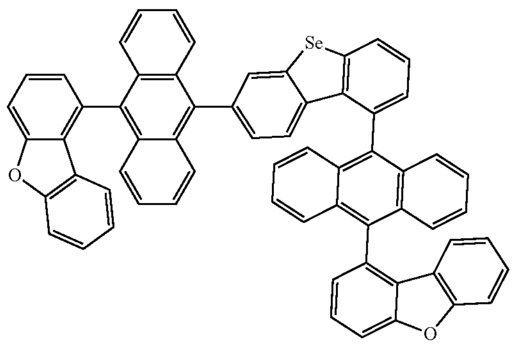
1488
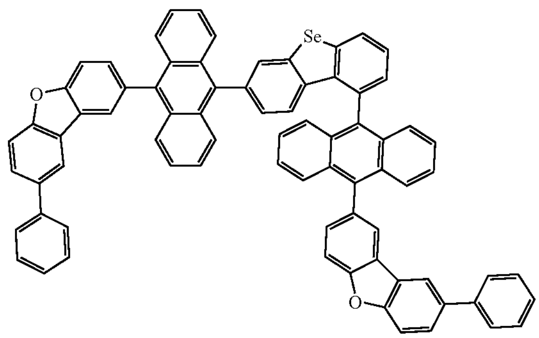
1489
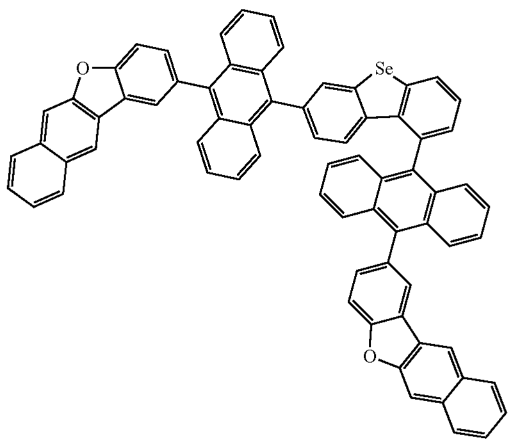
1490
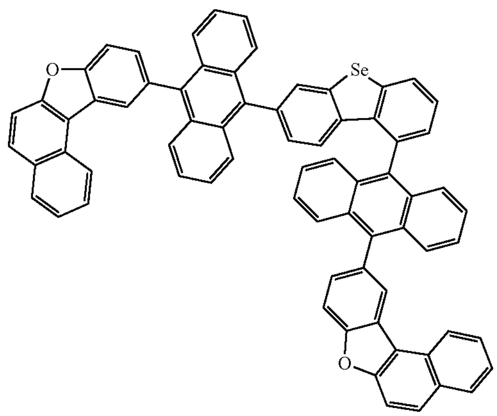
1491
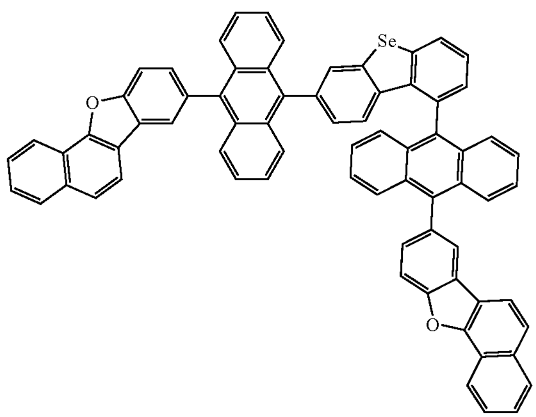
1492
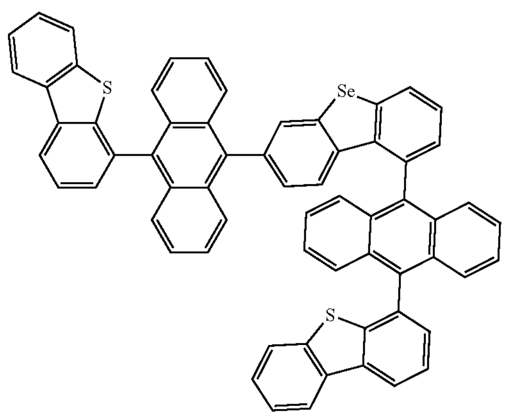

-continued
1493
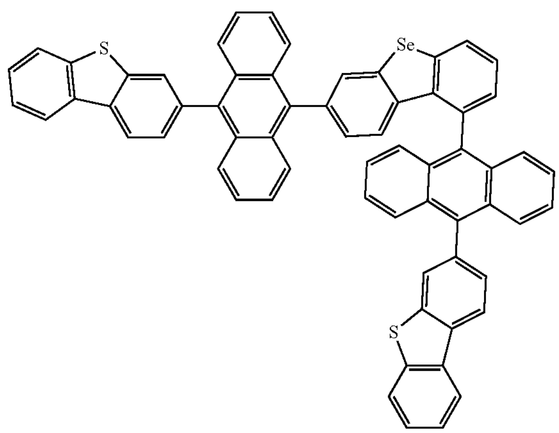
1494
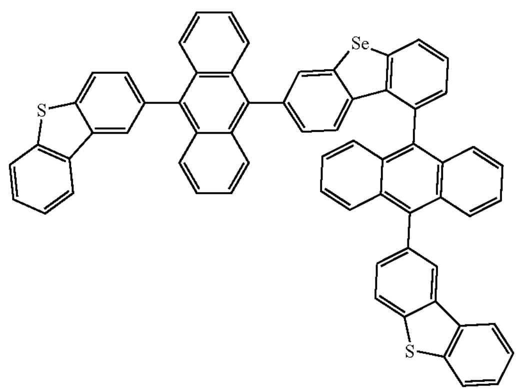
1495
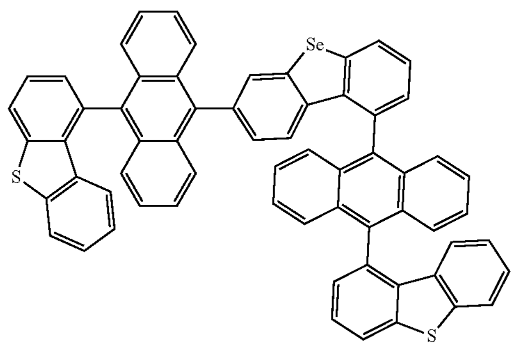
1496
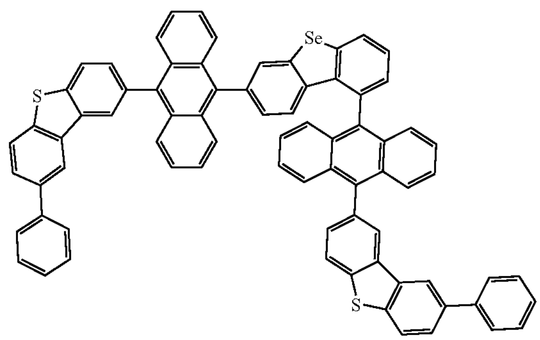
1497
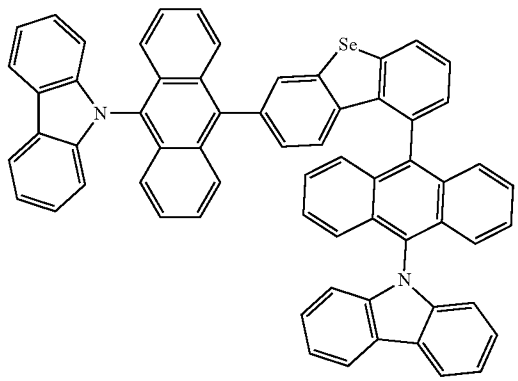
1498
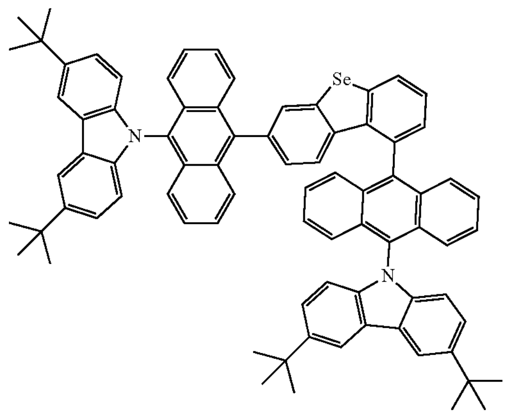

-continued
1499
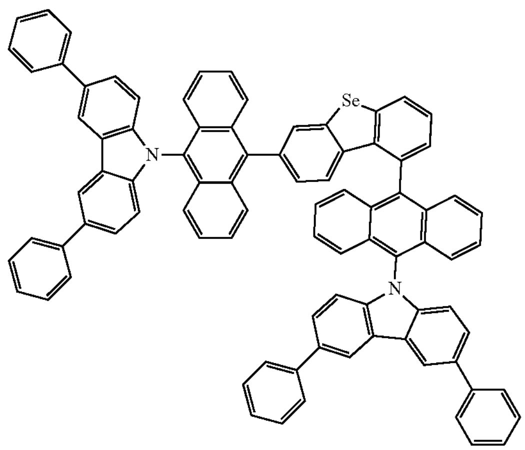
1500
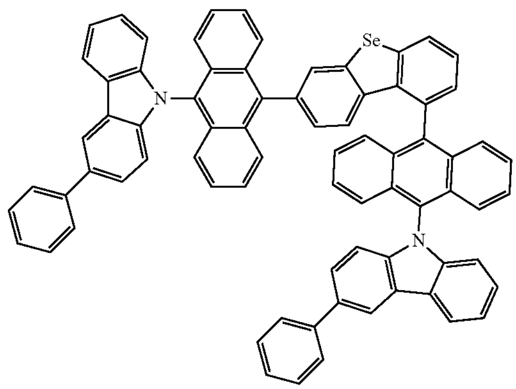
1501
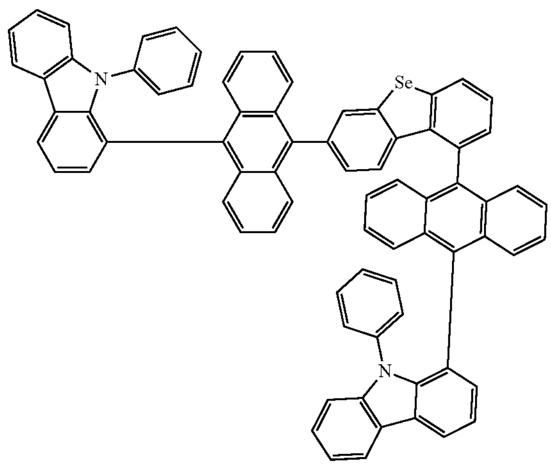
1502
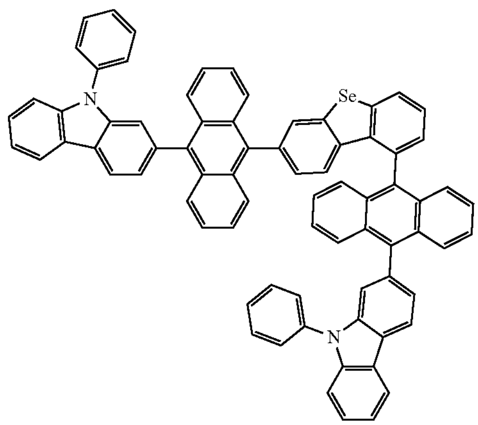
1503
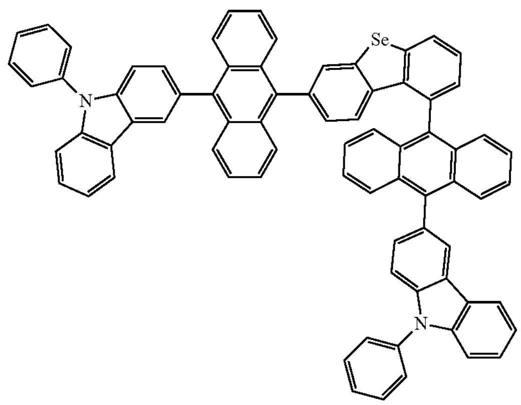
1504
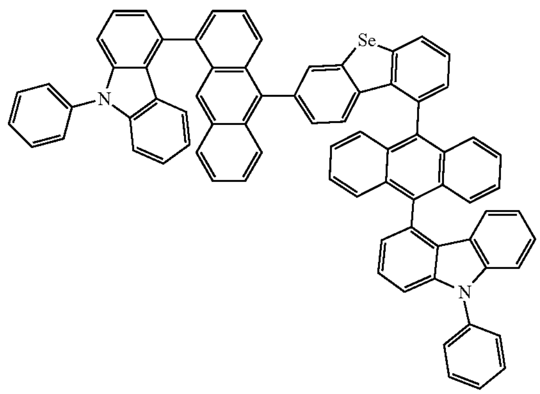

-continued
1505
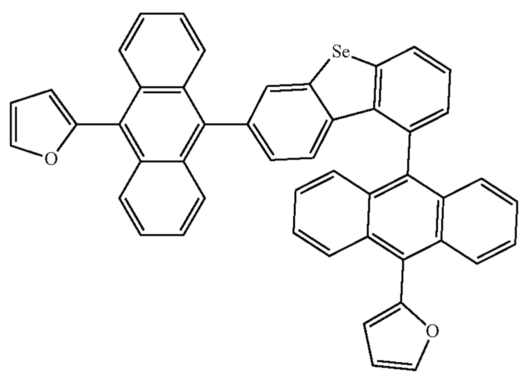
1506
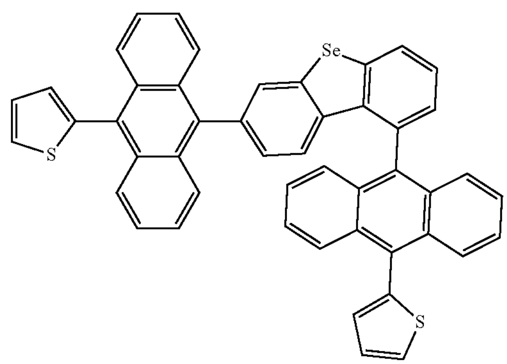
1507
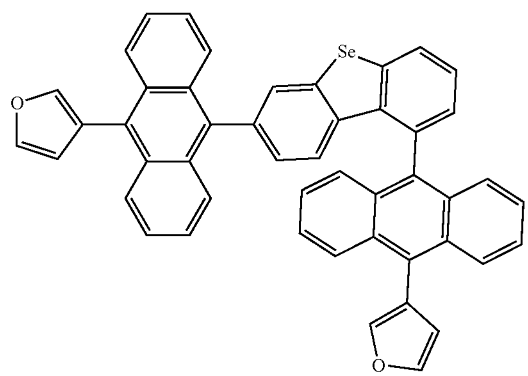
1508
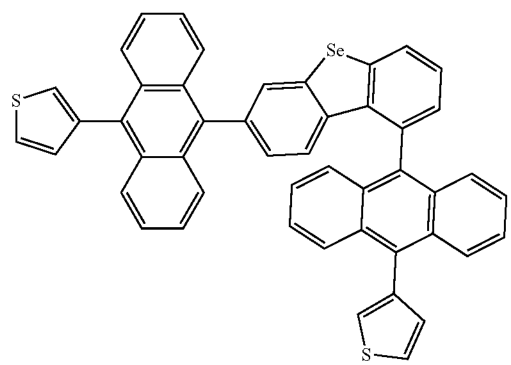
1509
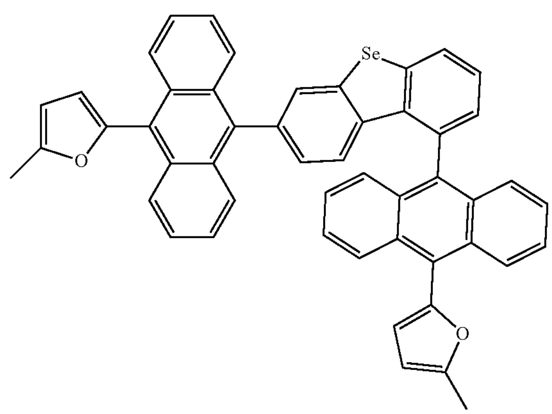
1510
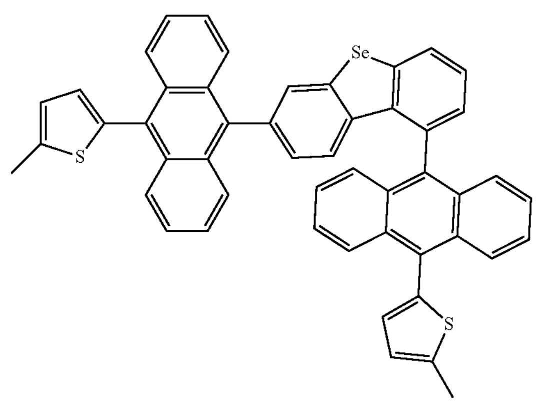
1511
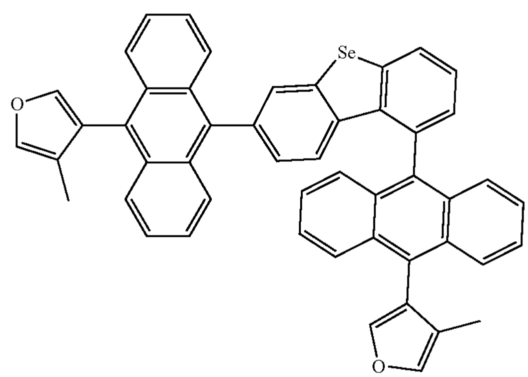
1512
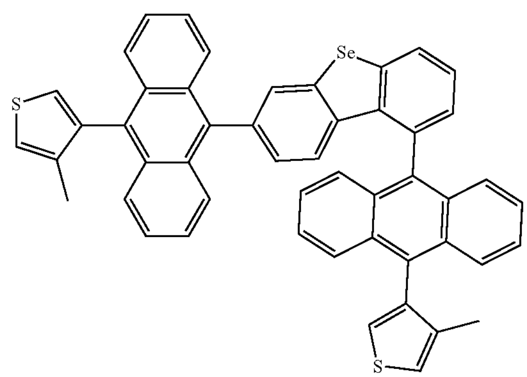

-continued
1513
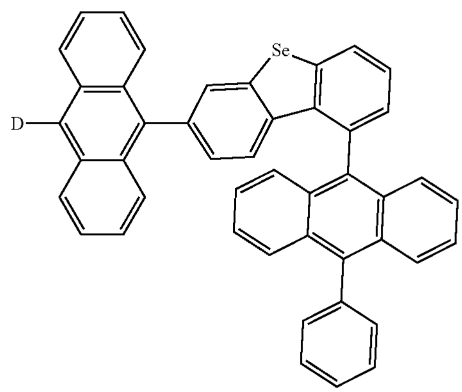
1514
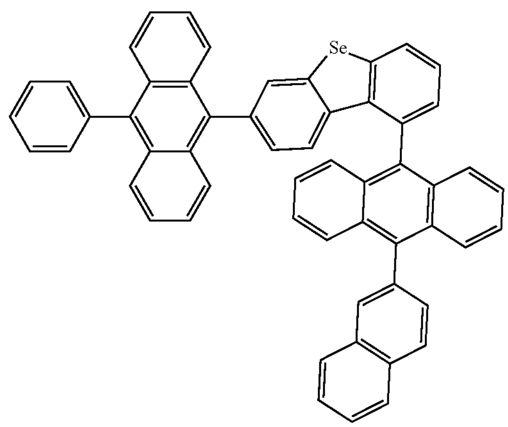
1515
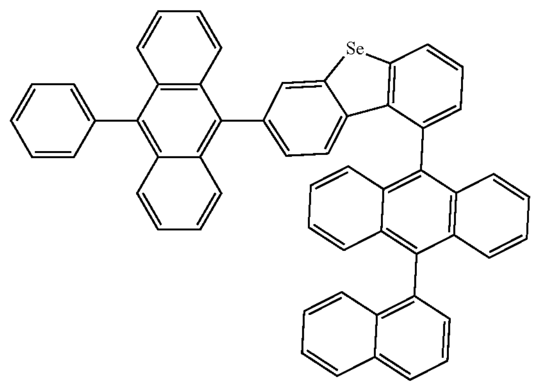
1516
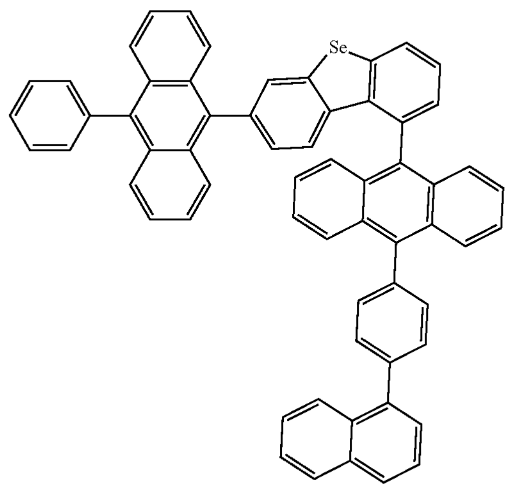
1517
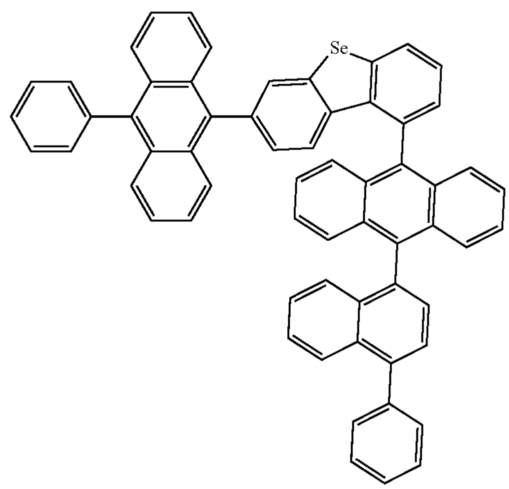
1518
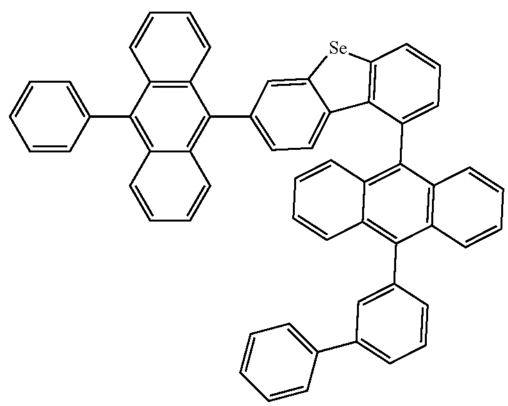

-continued
1519
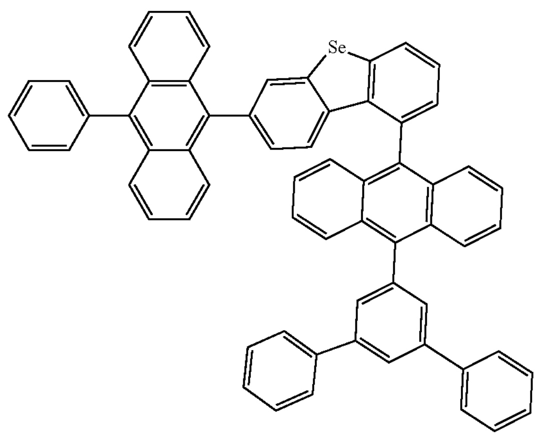
1520
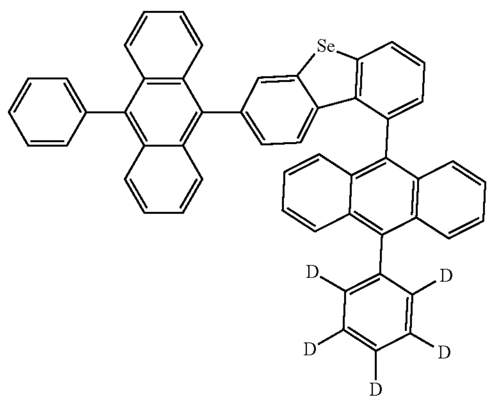
1521
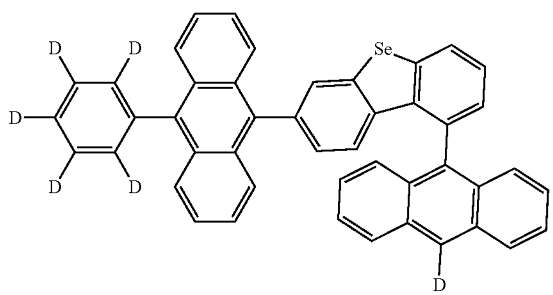
1522
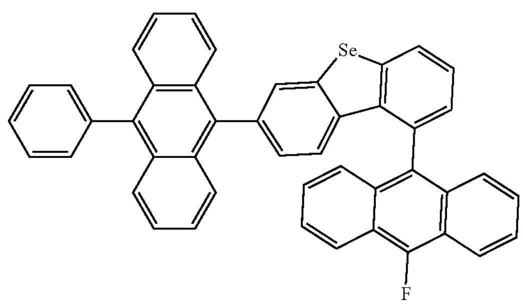
1523
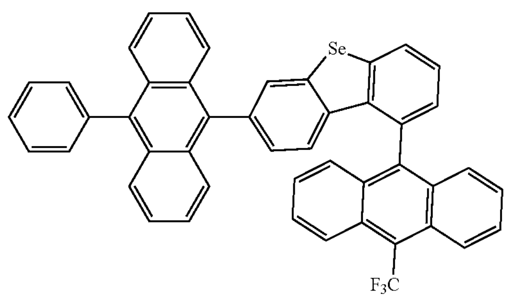
1524
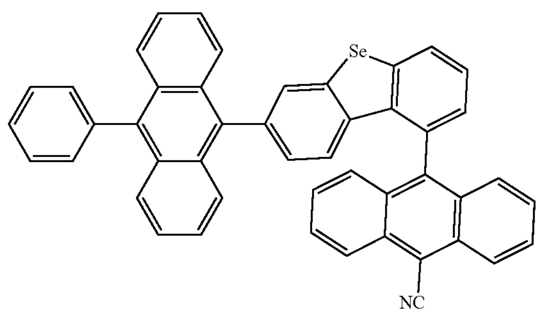
1525
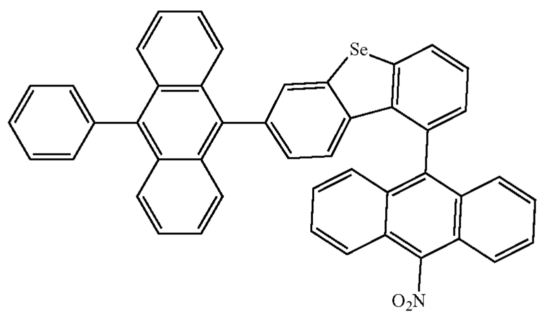
1526
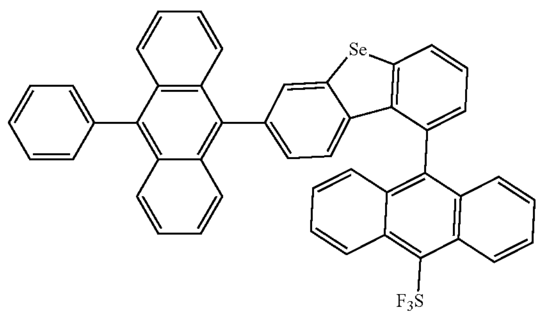

-continued
1527
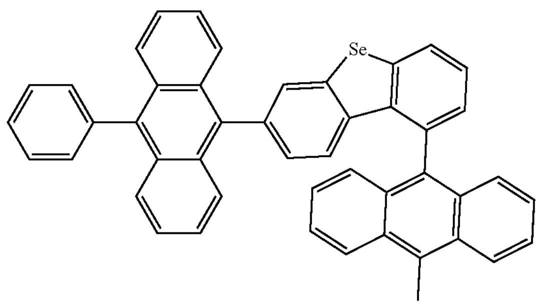
1528
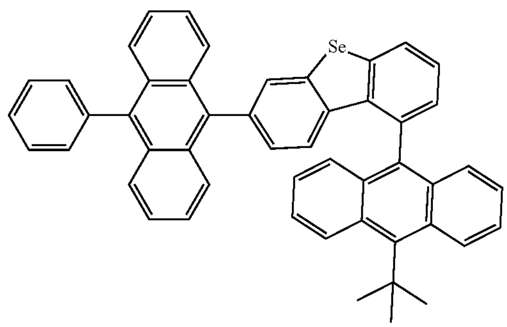
1529
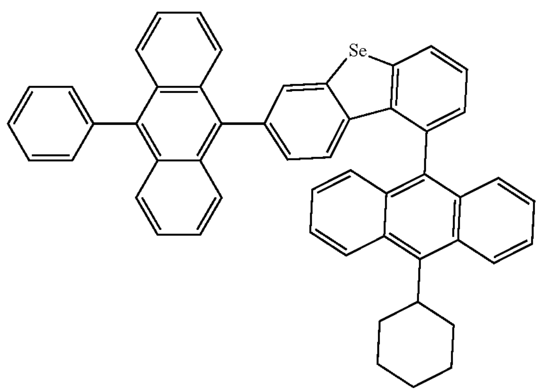
1530
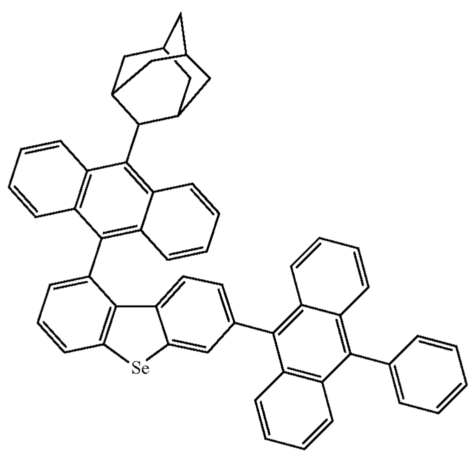
1531
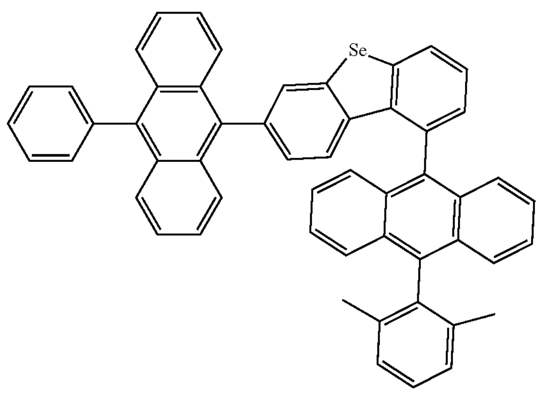
1532
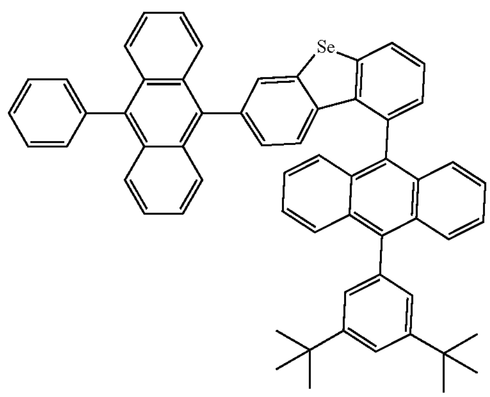
1533
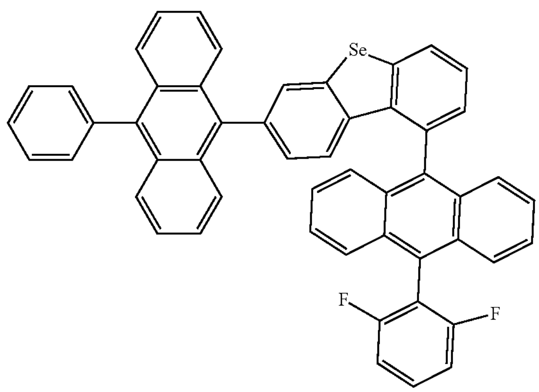
1534
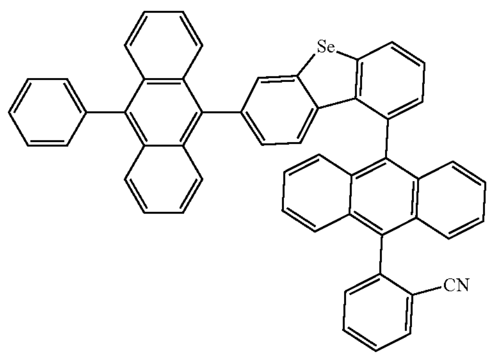

-continued
1535
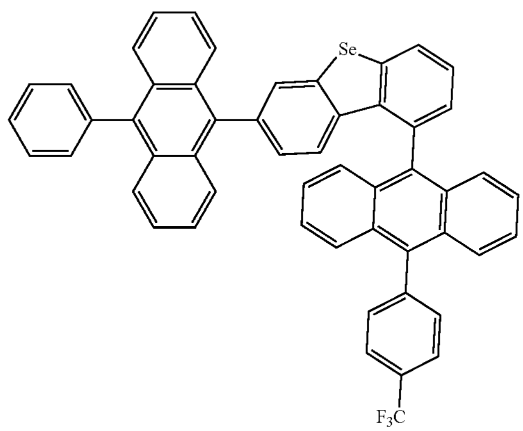
1536
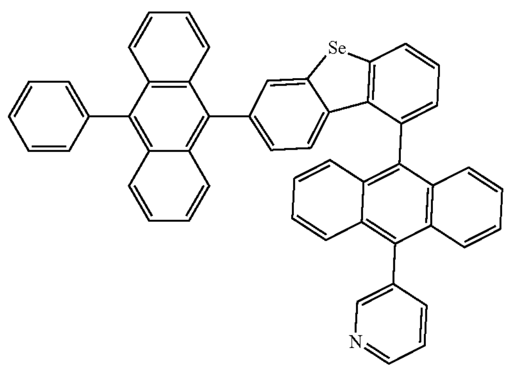
1537
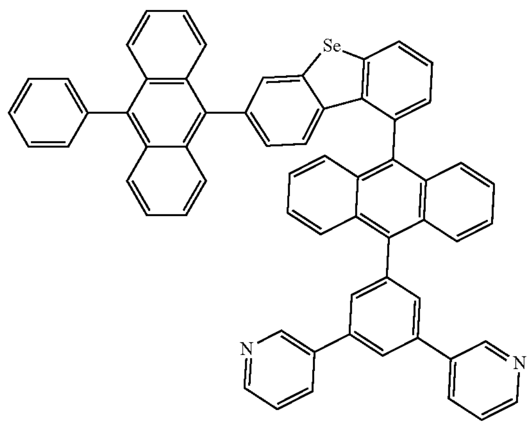
1538
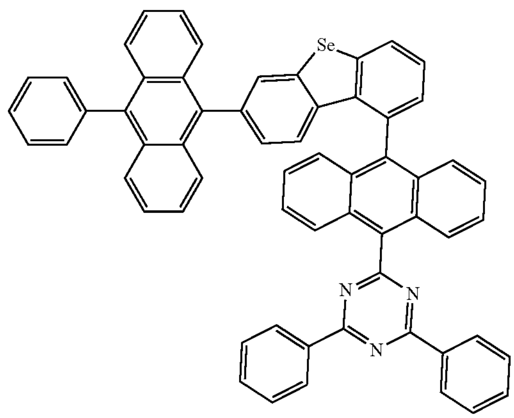
1539
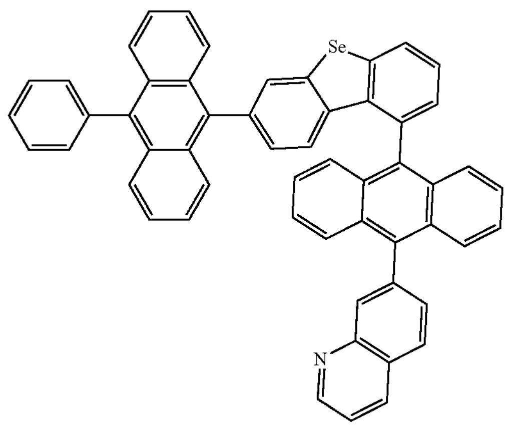
1540
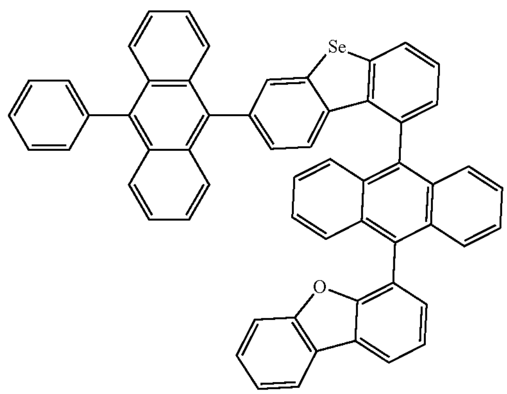

-continued
1541
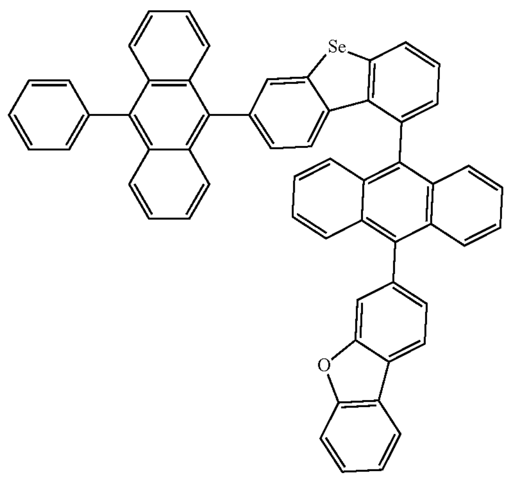
1542
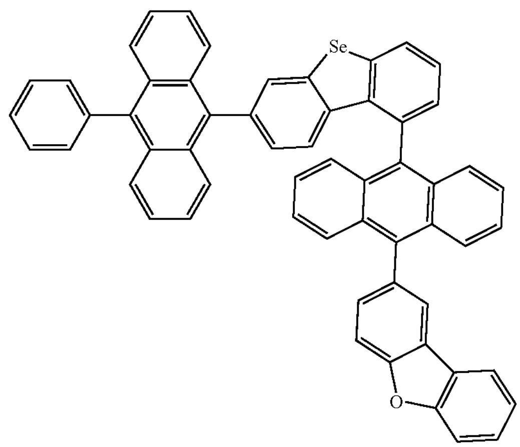
1543
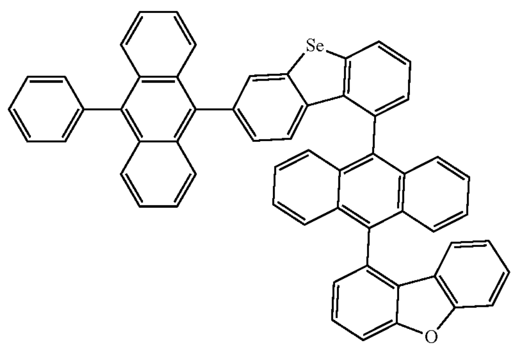
1544
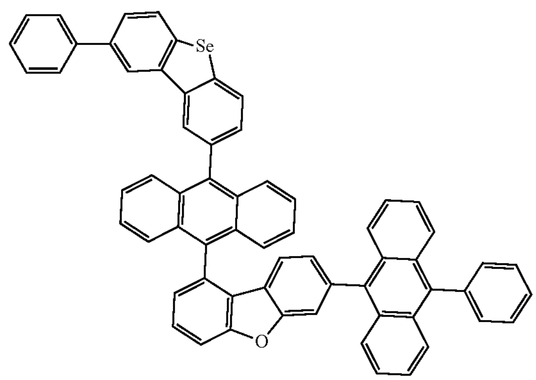
1545
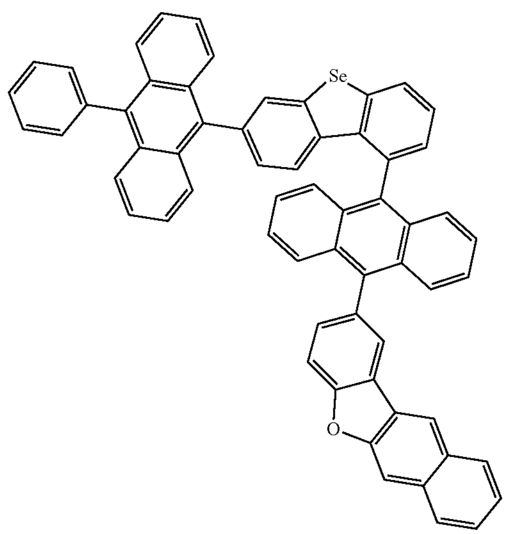
1546
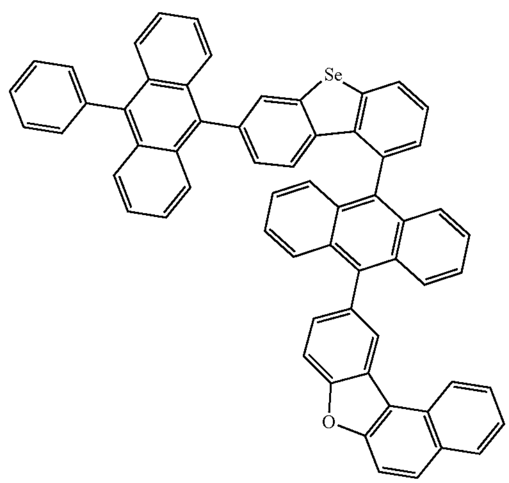

-continued
1547
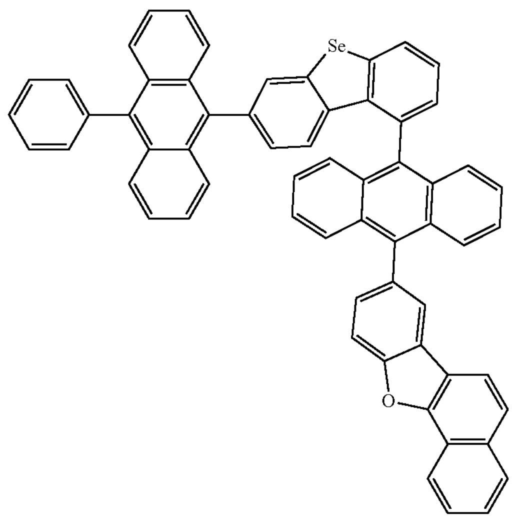
1548
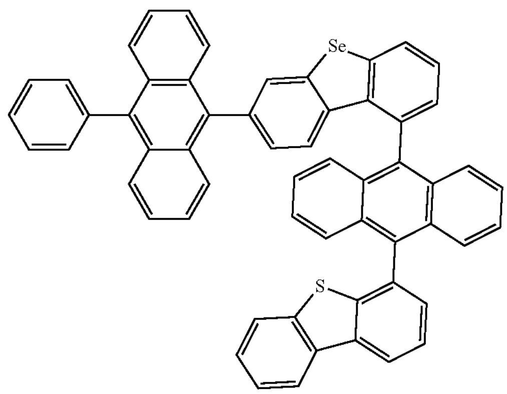
1549
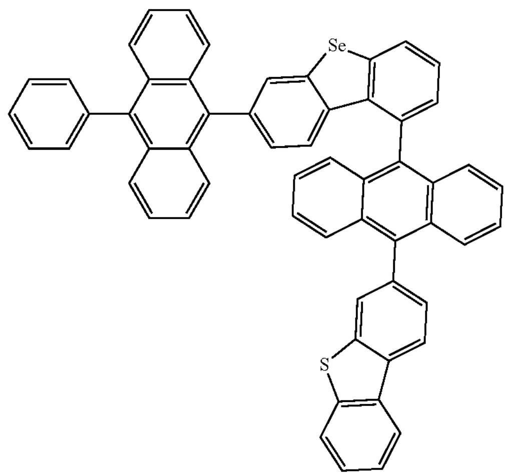
1550
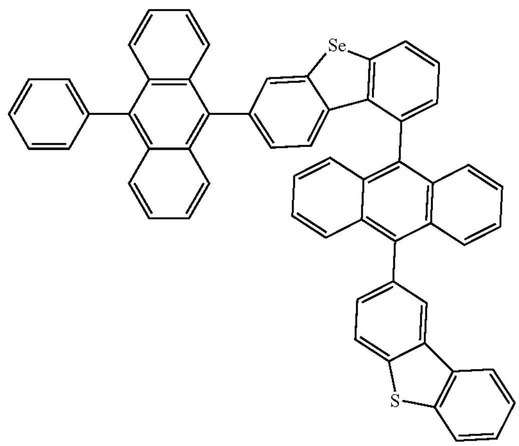
1551
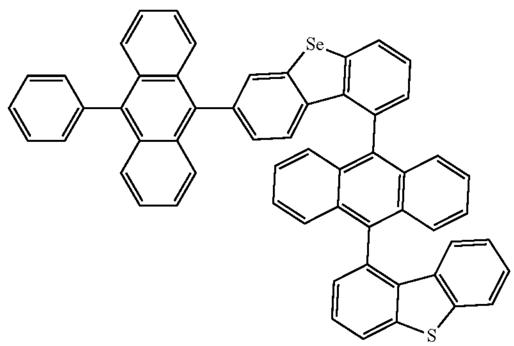
1552
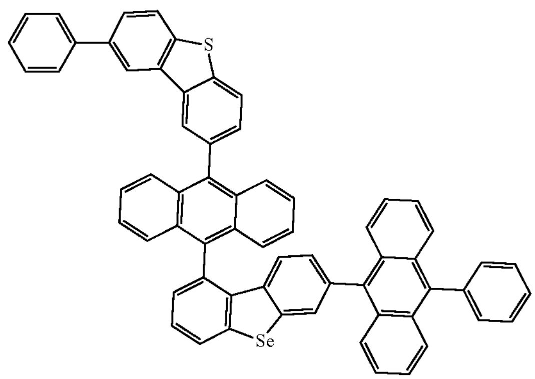

-continued
1553
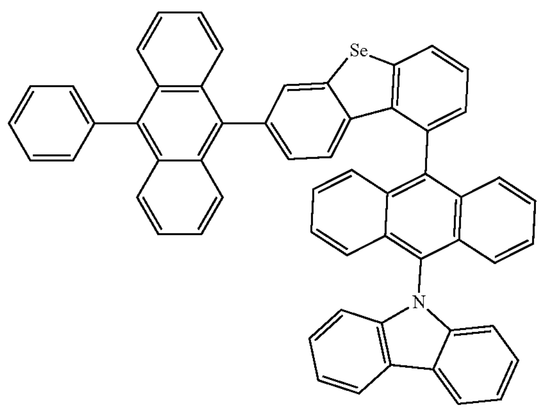
1554
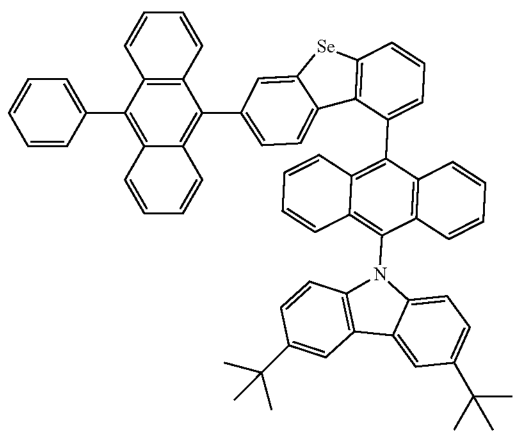
1555
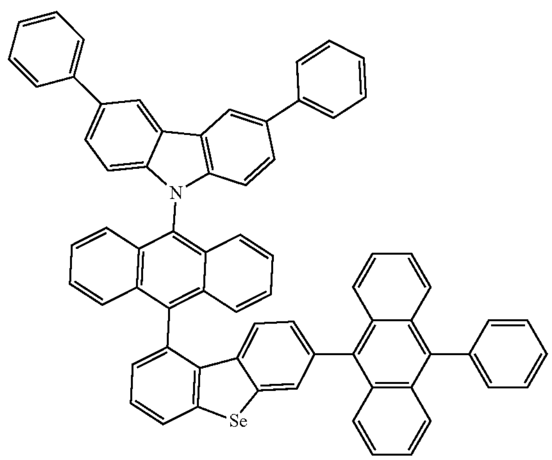
1556
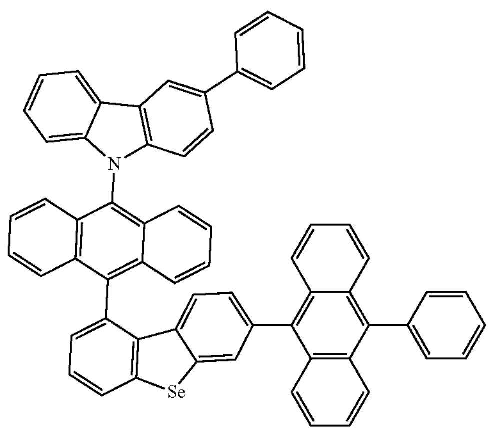
1557
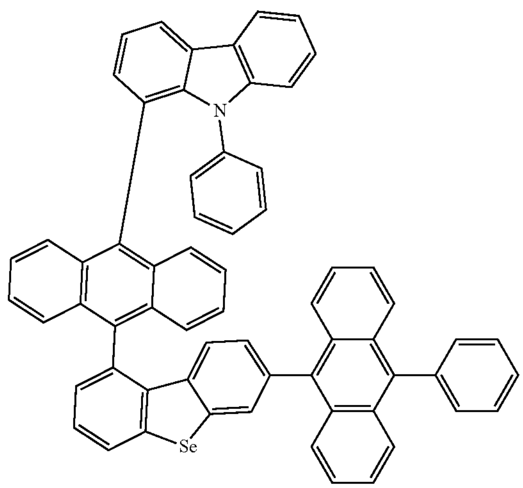
1558
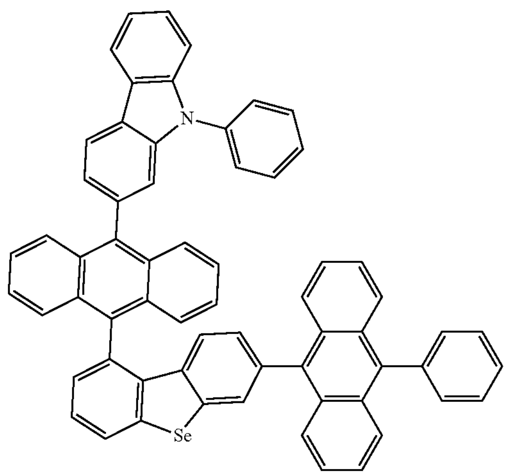

-continued
1559
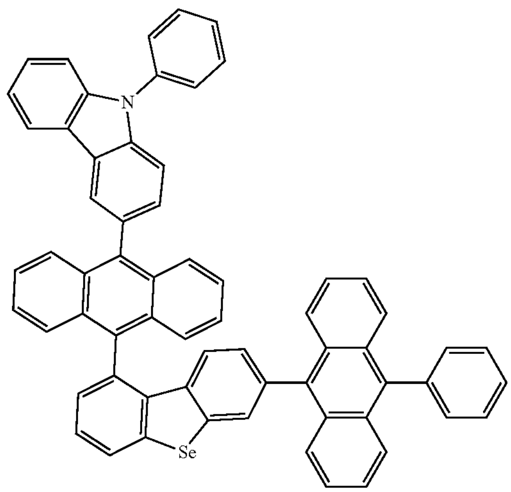
1560
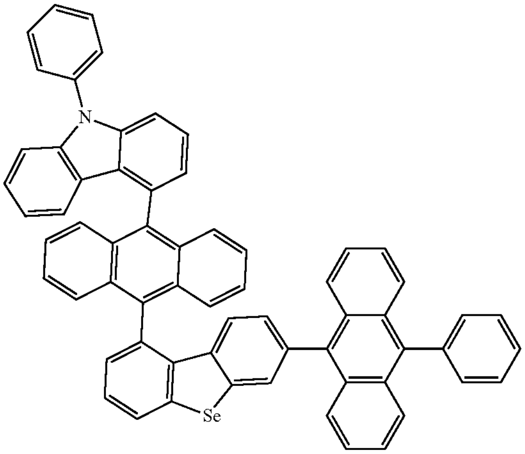
1561
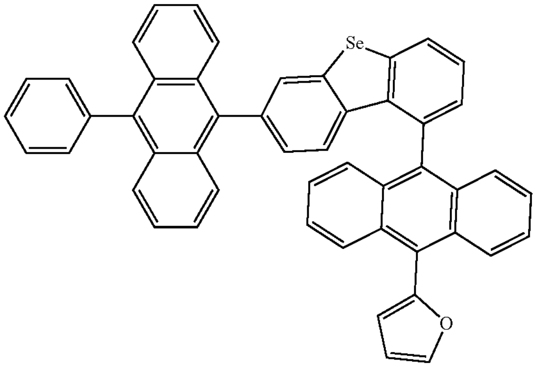
1562
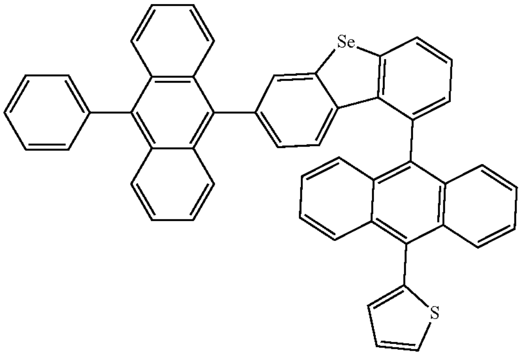
1563
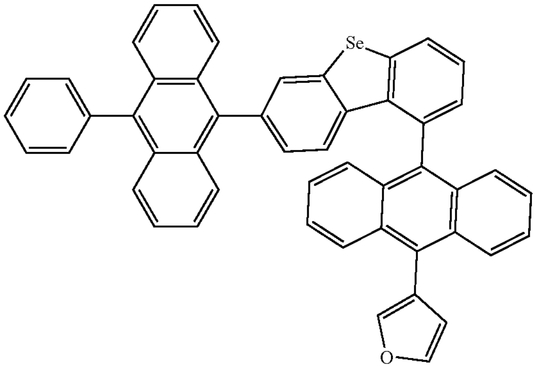
1564
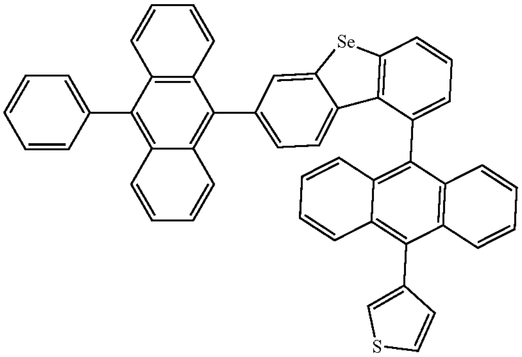

-continued
1565
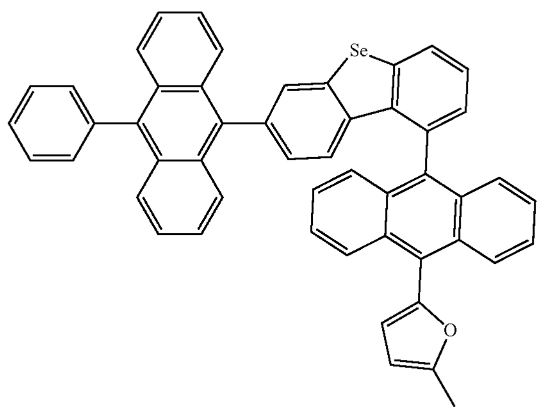
1566
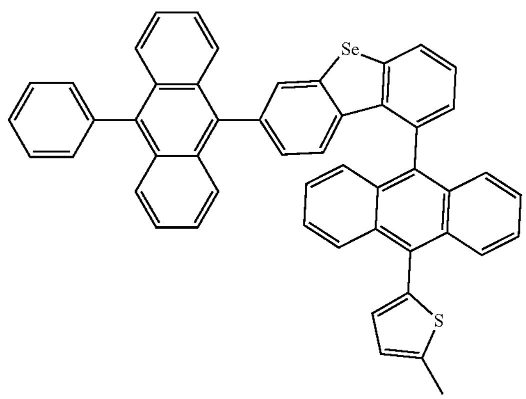
1567
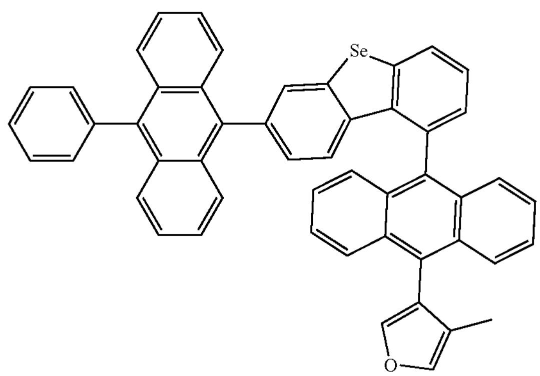
1568
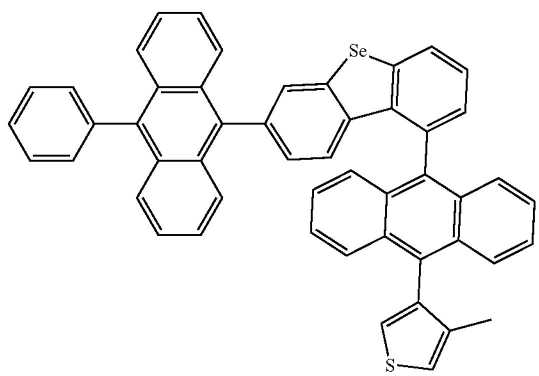
1569
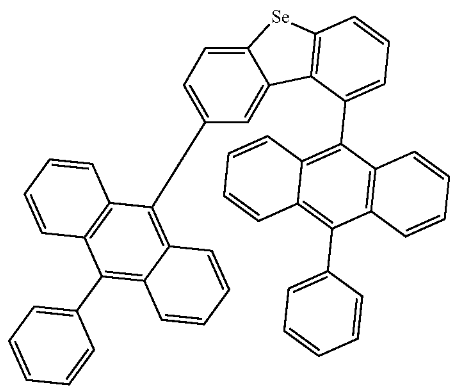
1570
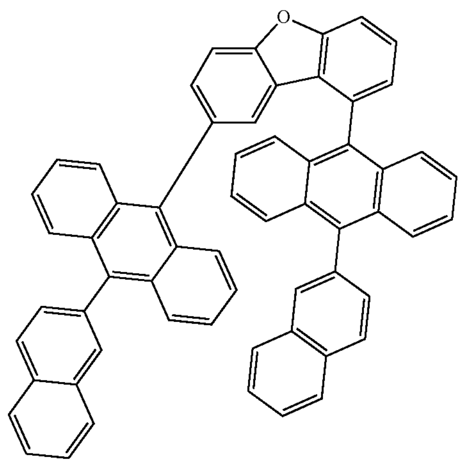

-continued
1571
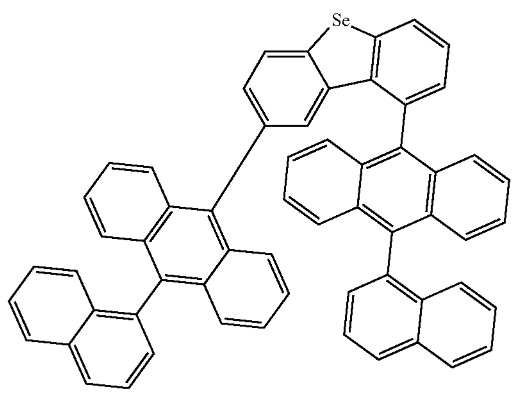
1572
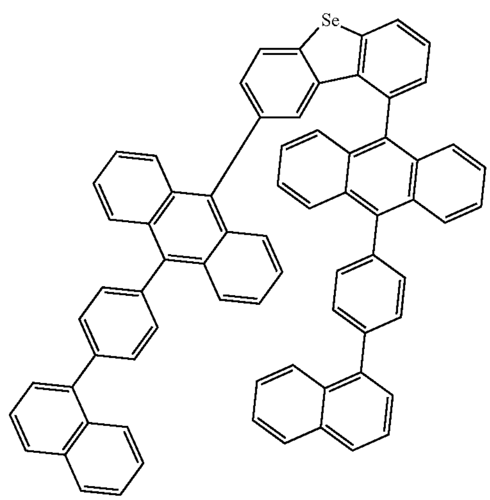
1573
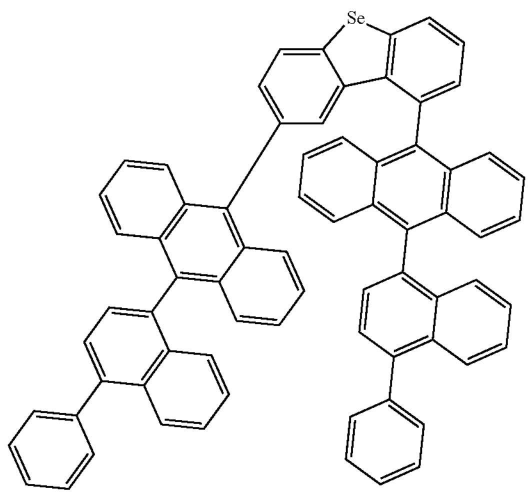
1574
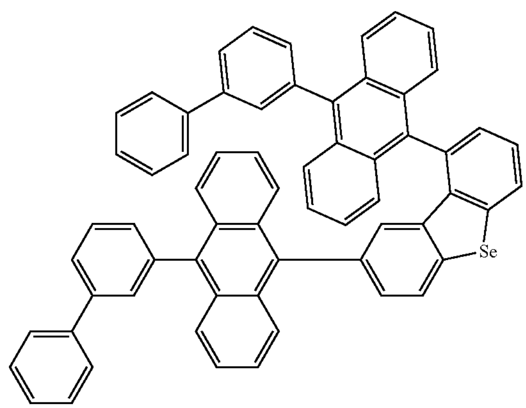
1575
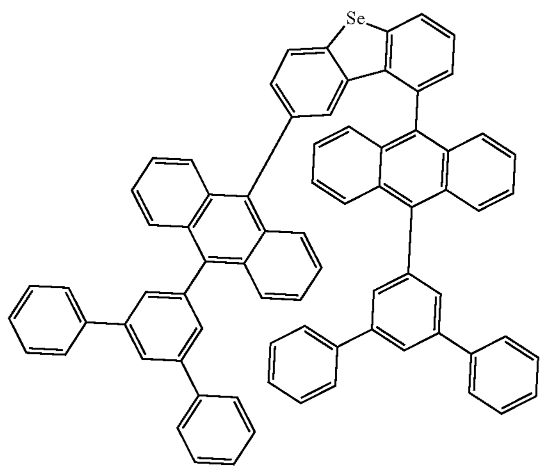
1576
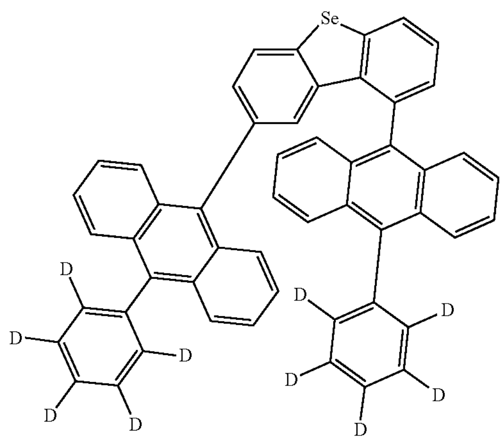

-continued
1577
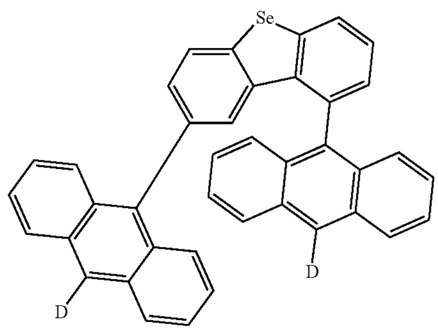
1578
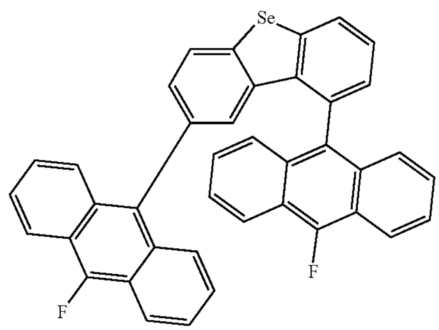
1579
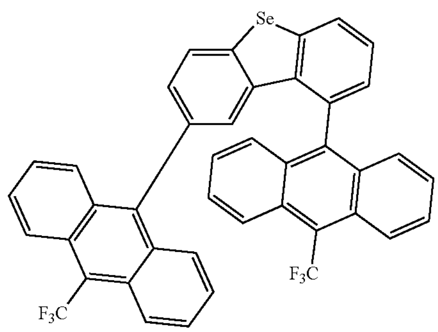
1580
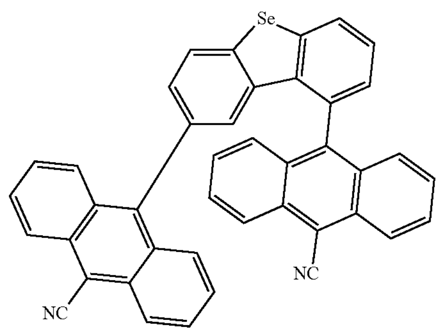
1581
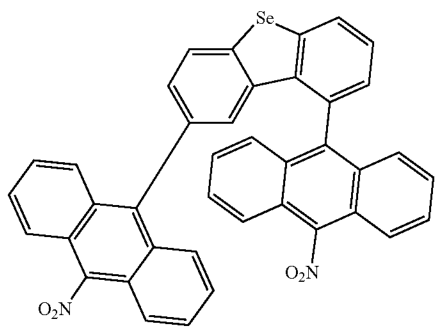
1582
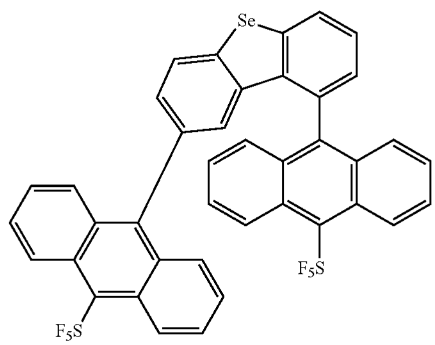
1583
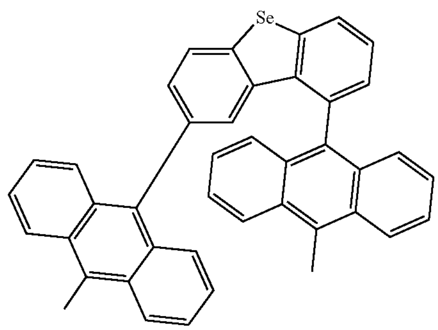
1584
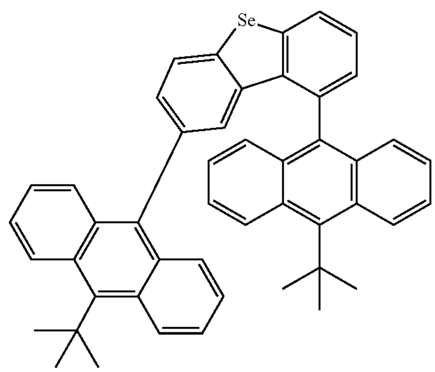

-continued
1585
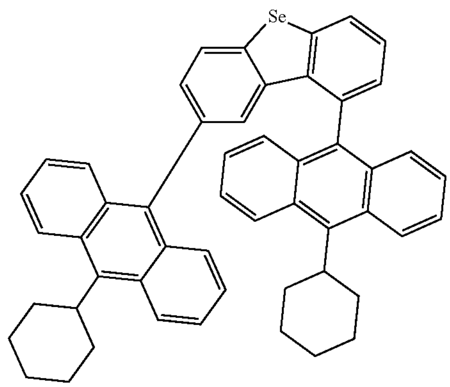
1586
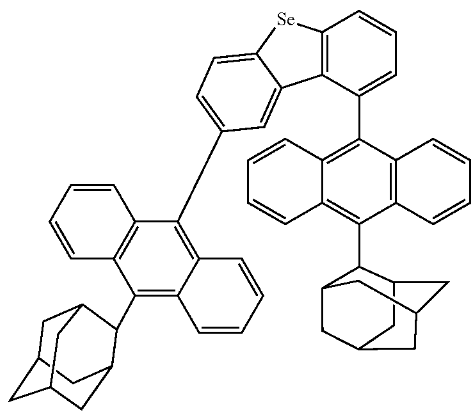
1587
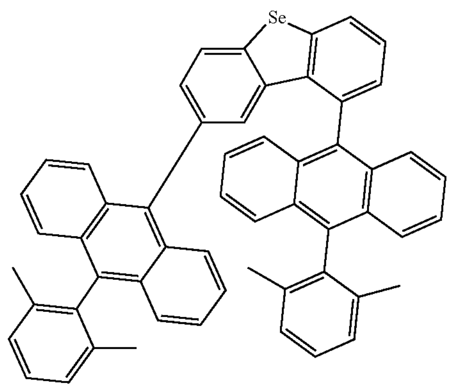
1588
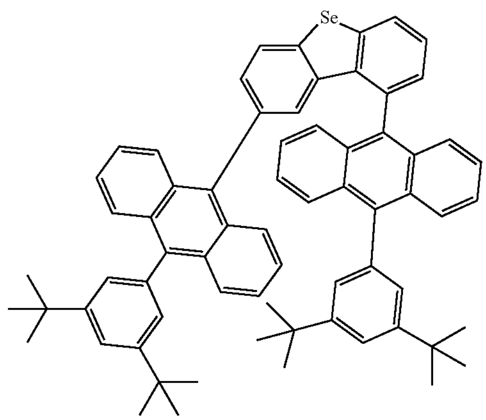
1589
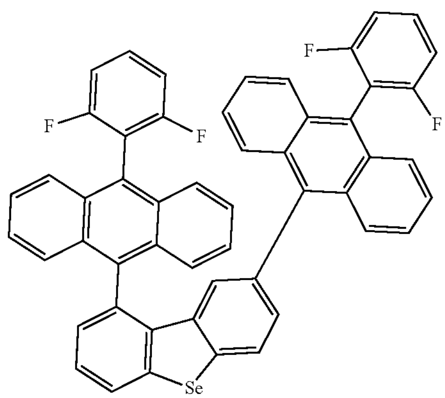
1590
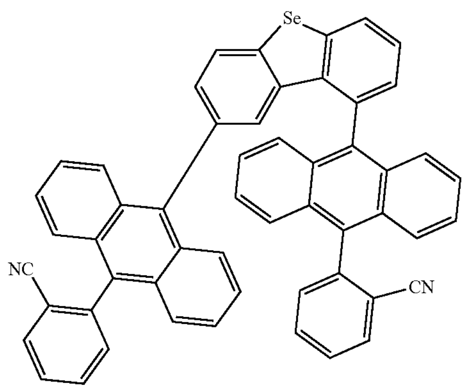
1591
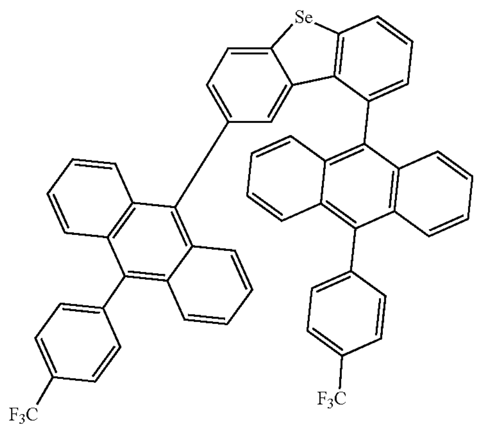
1592
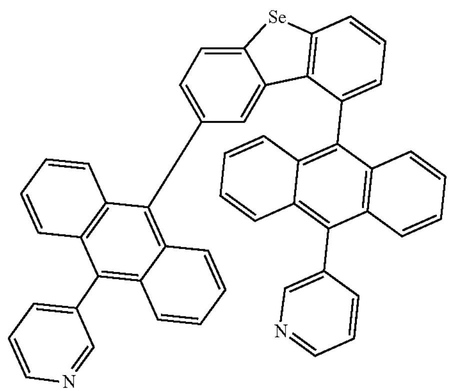

-continued
1593
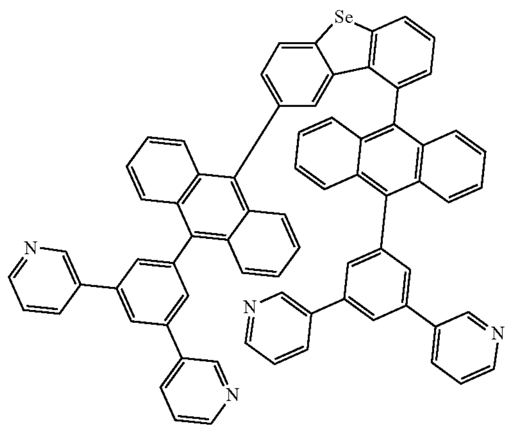
1594
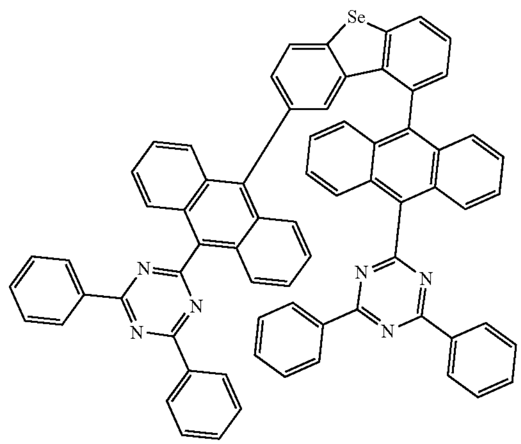
1595
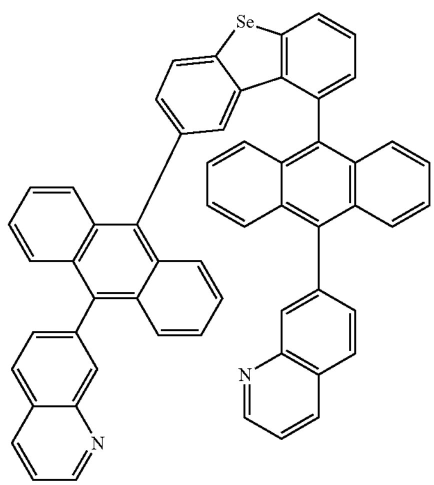
1596
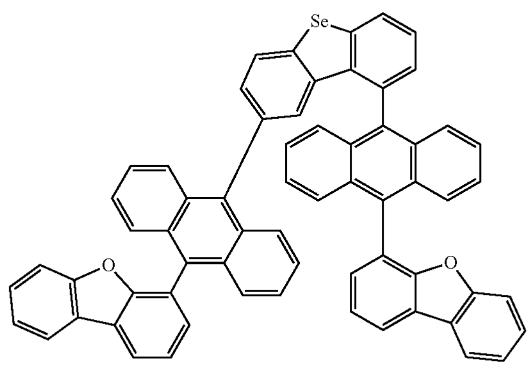
1597
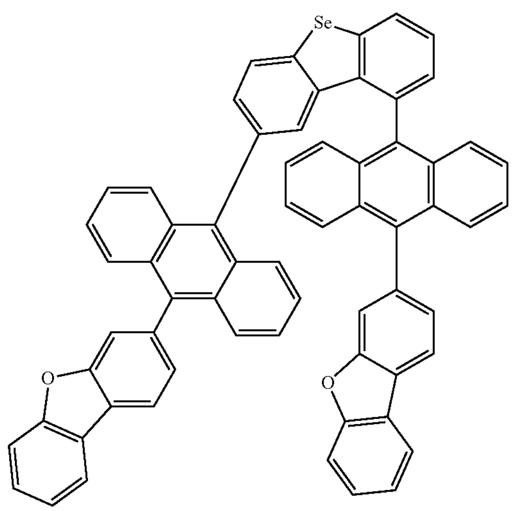
1598
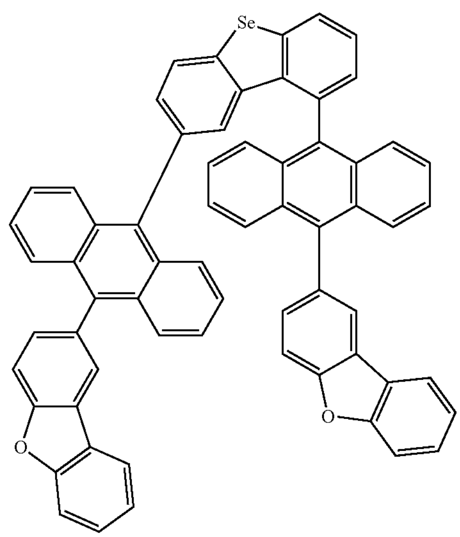

-continued
1599
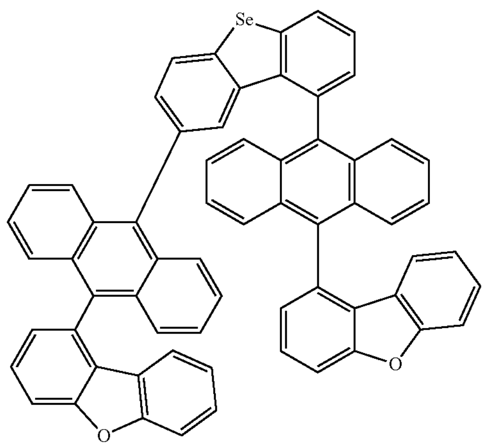
1600
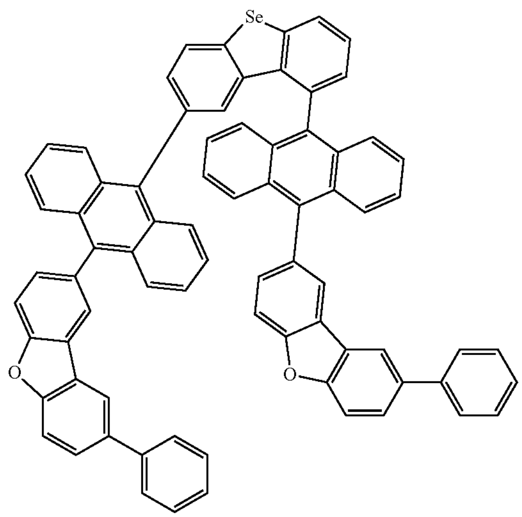
-continued
1601
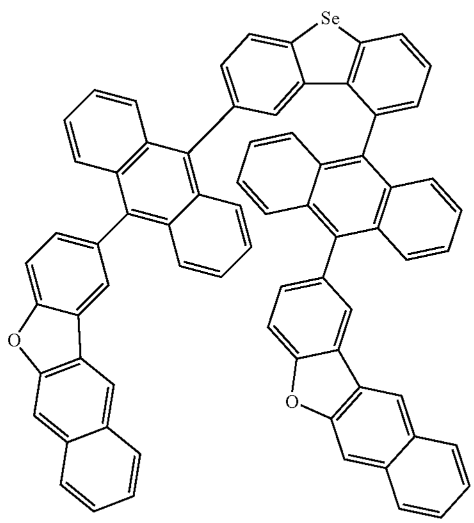
1603
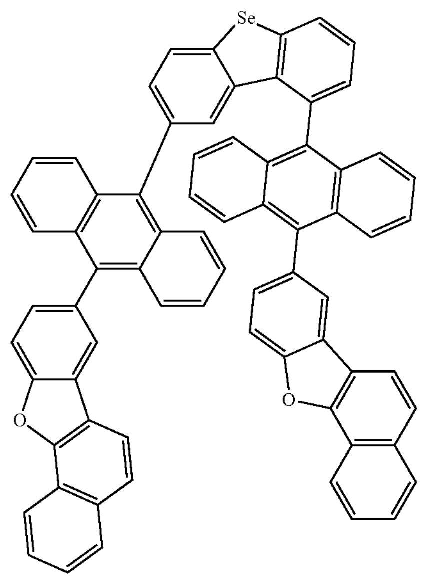
1602
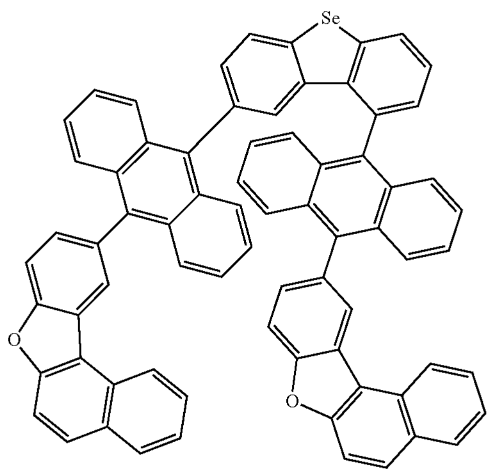
1604
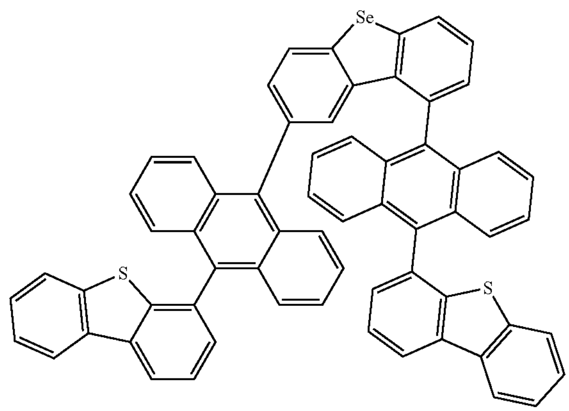

-continued
1605
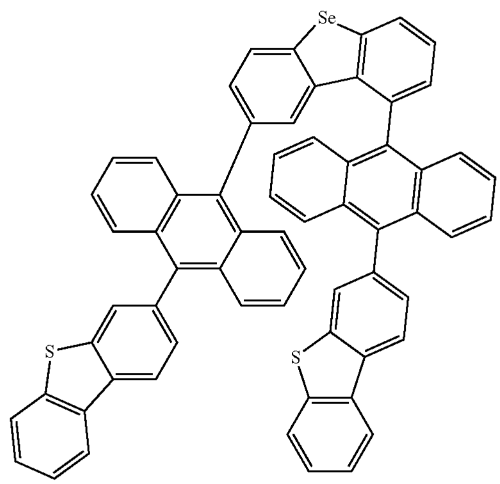
1606
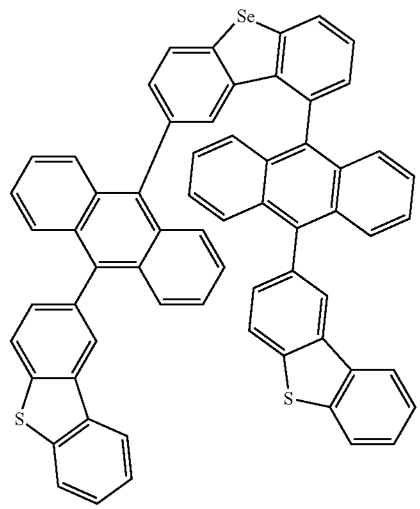
1607
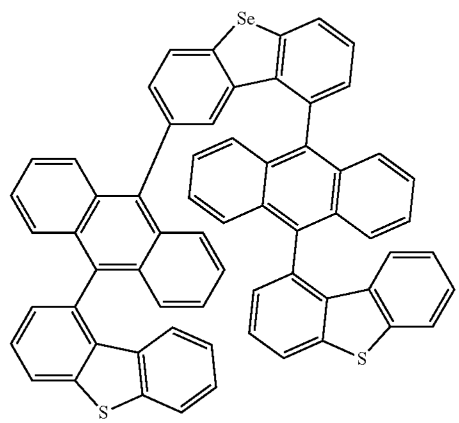
-continued
1608
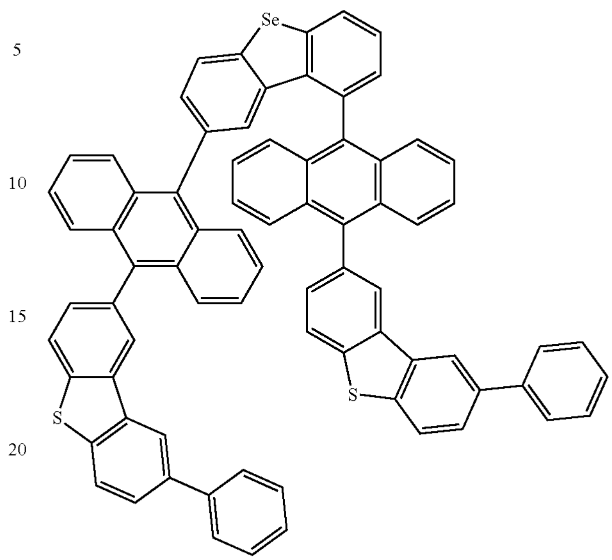
1609
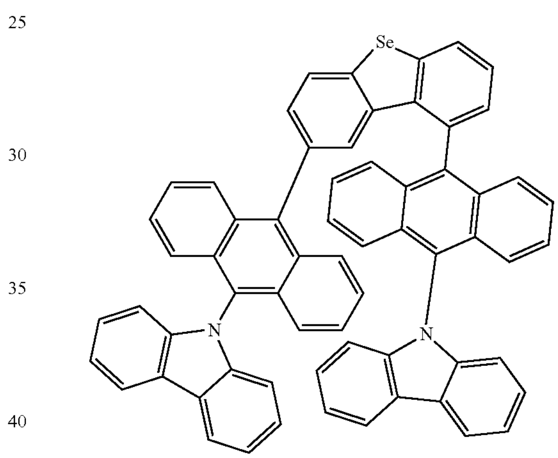
1610
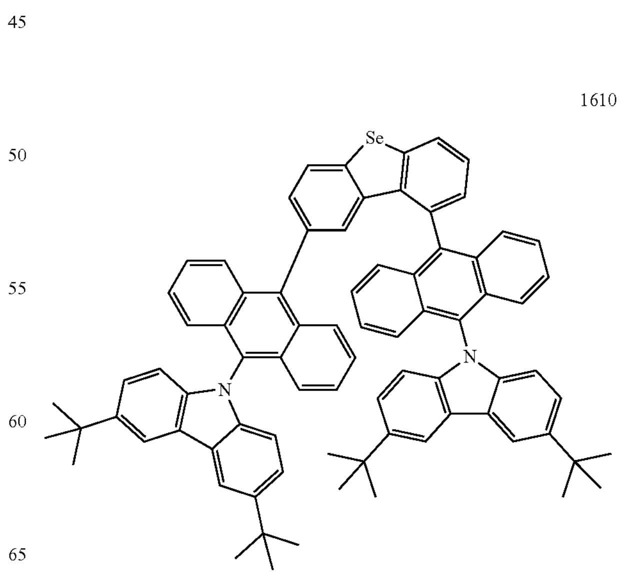

1611
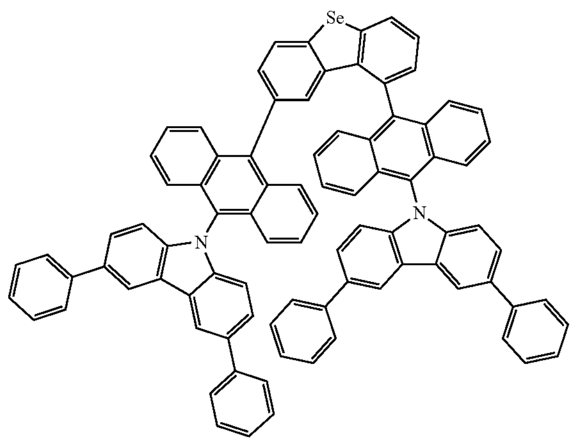
1612
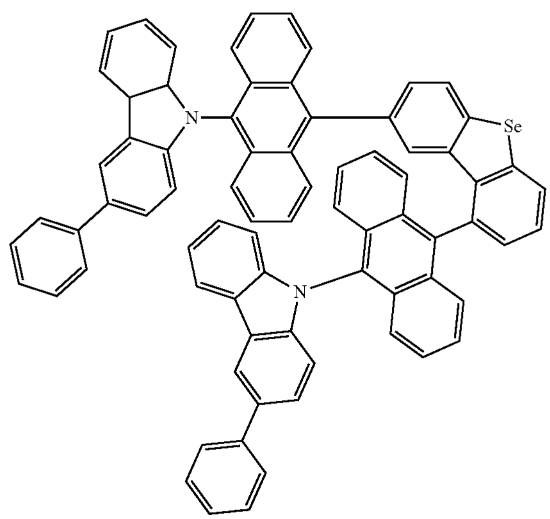
1613
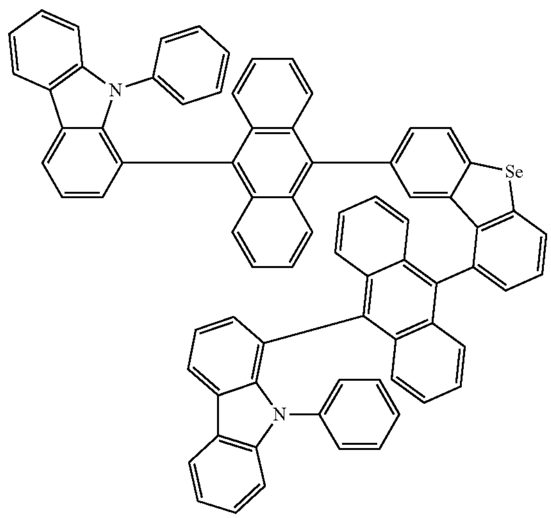
1614
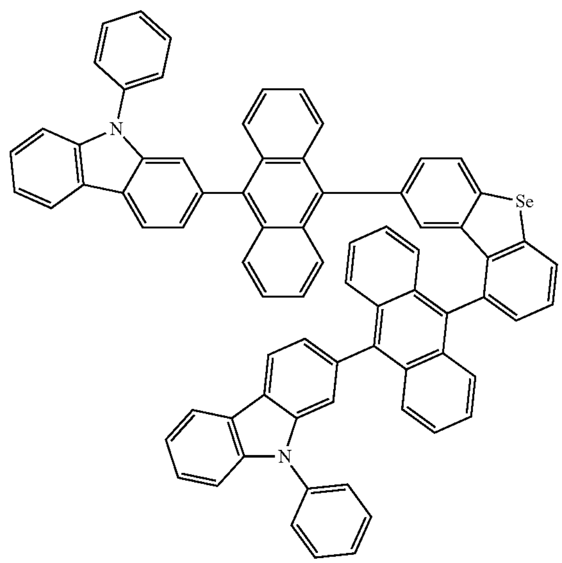
1615
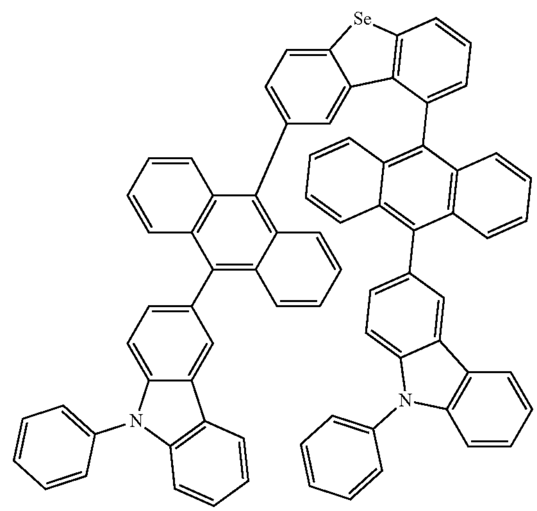
1616
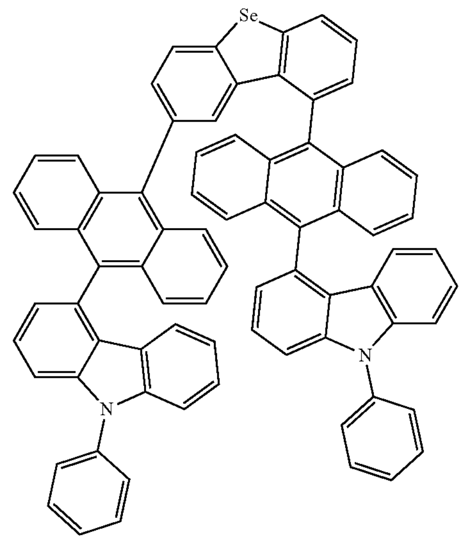

-continued
1617
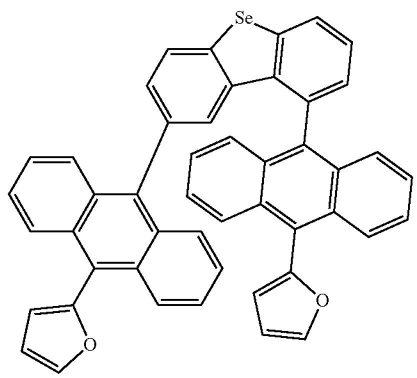
1618
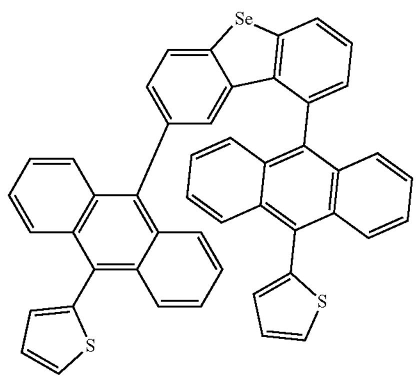
1619
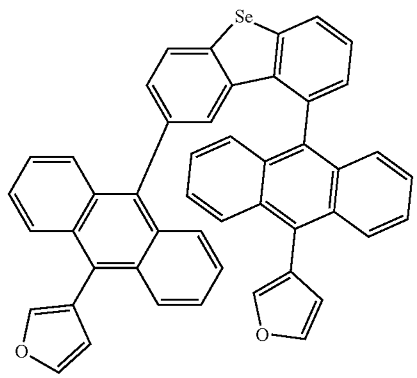
1620
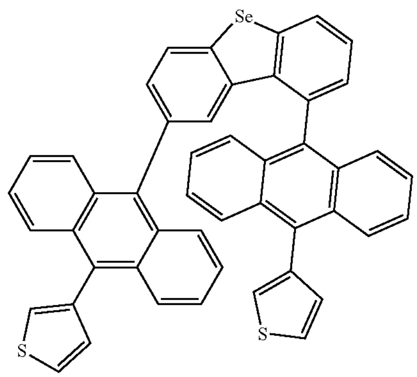
-continued
1621
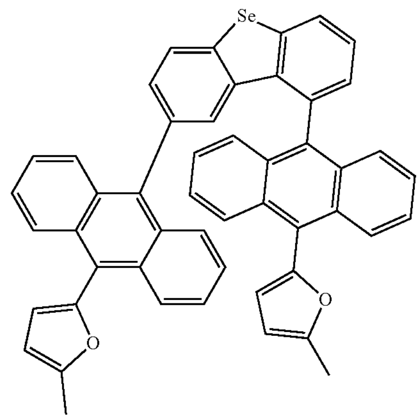
1622
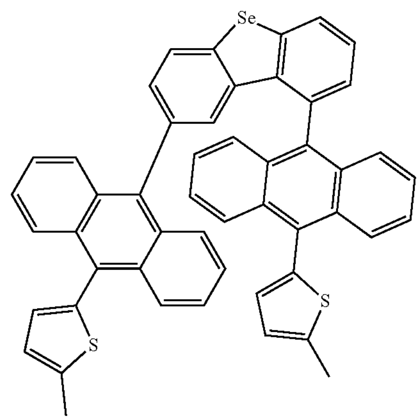
1623
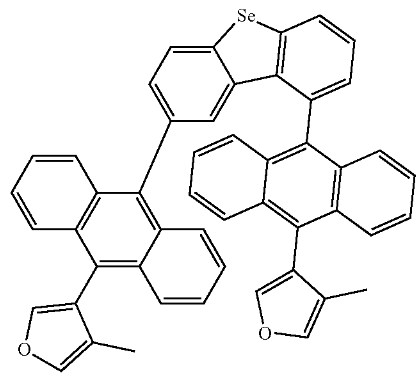
1624
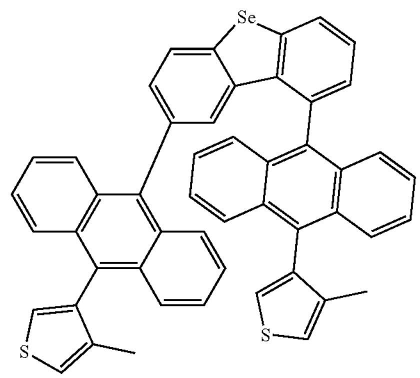

-continued
1625
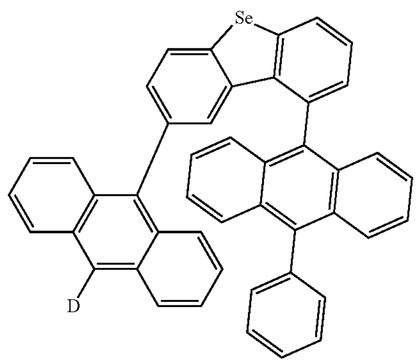
1626
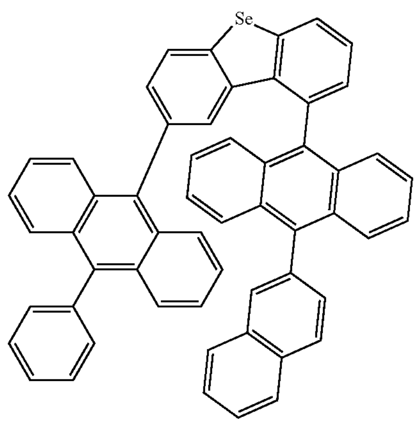
1627
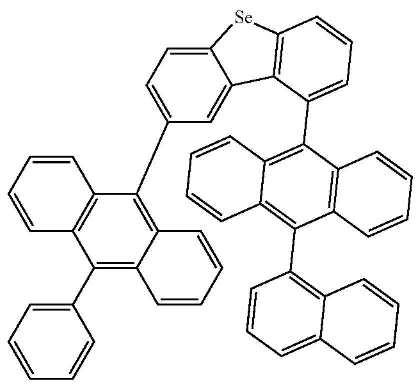
1628
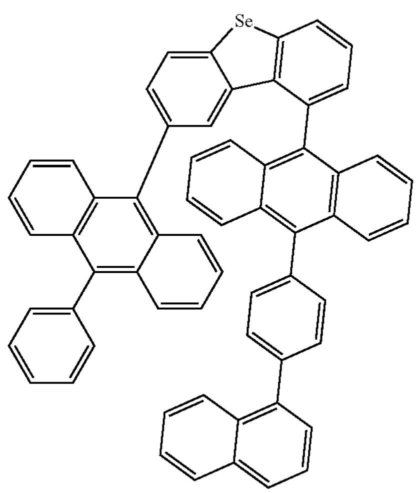
-continued
1629
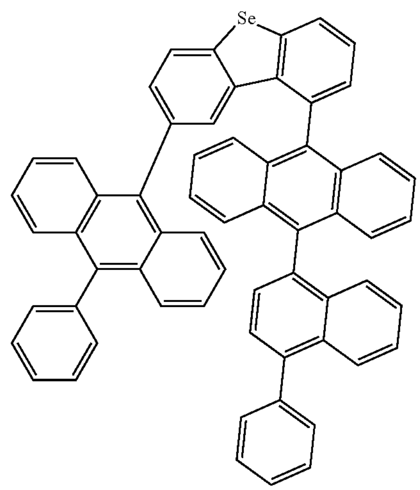
1630
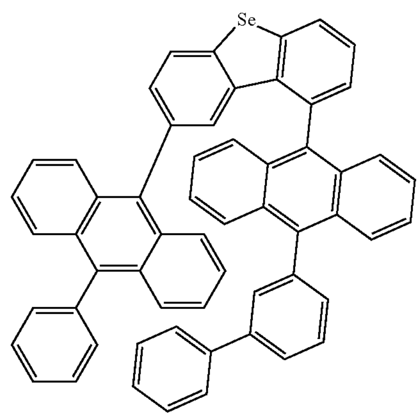
1631
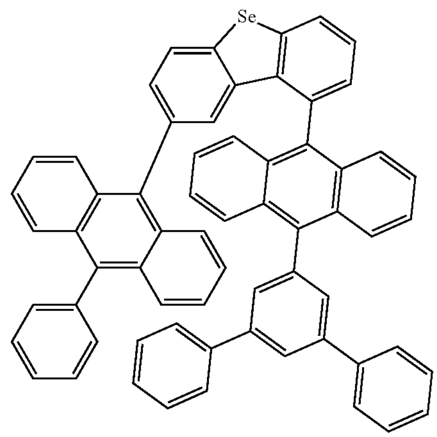

-continued
1632
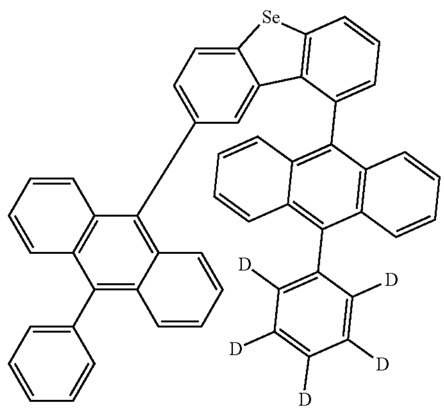
1633
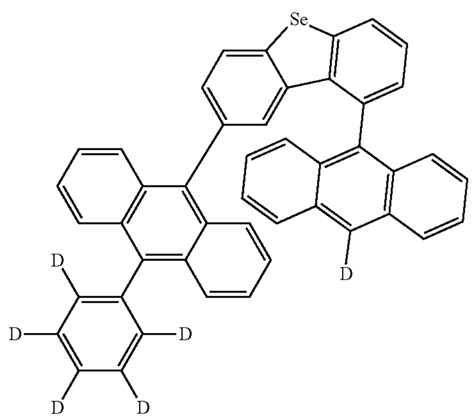
1634
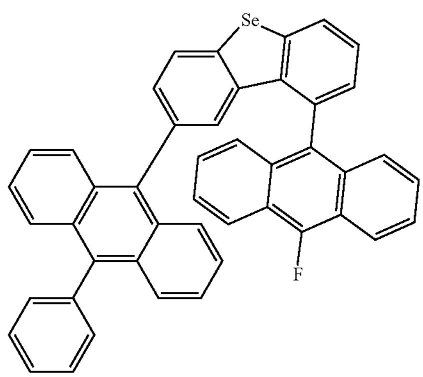
1635
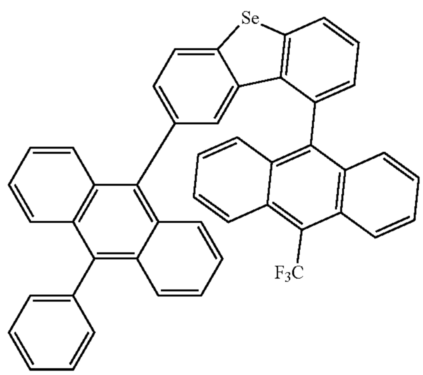
-continued
1636
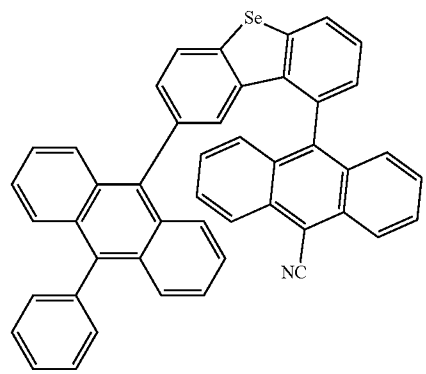
1637
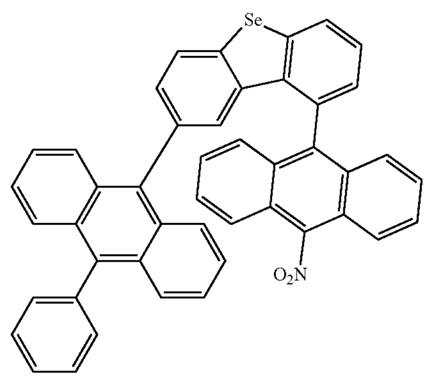
1638
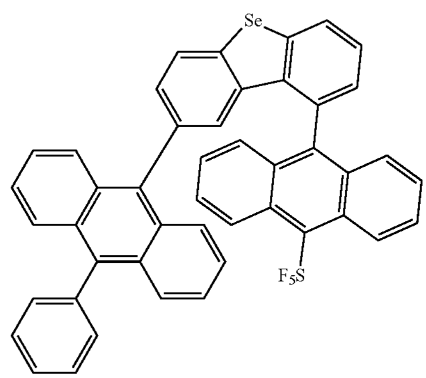
1639
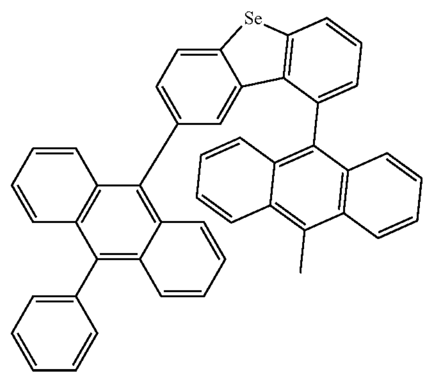

1640
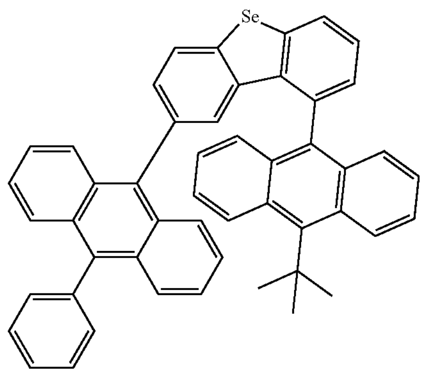
1641
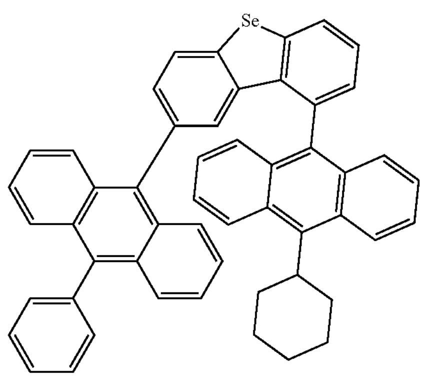
1642
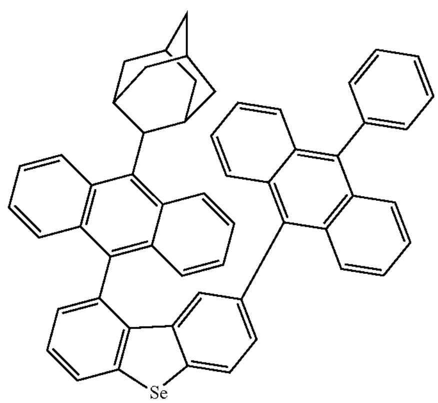
1643
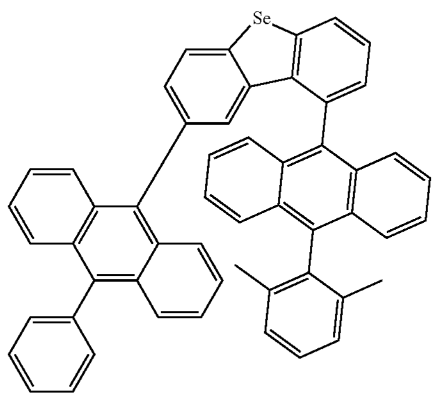
1644
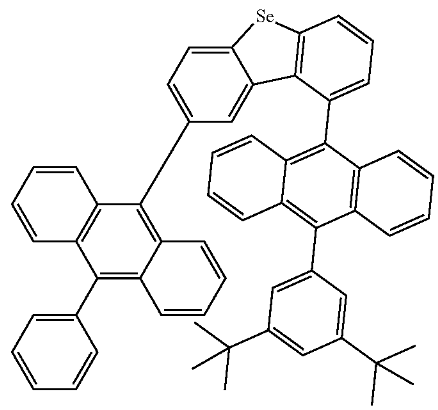
1645
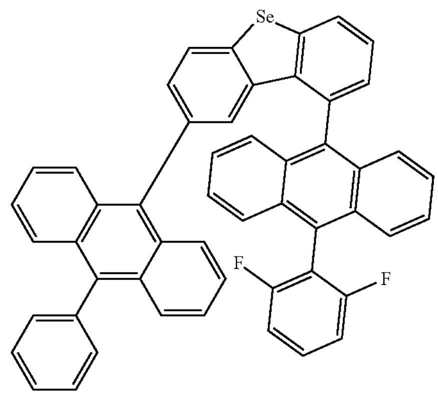
1646
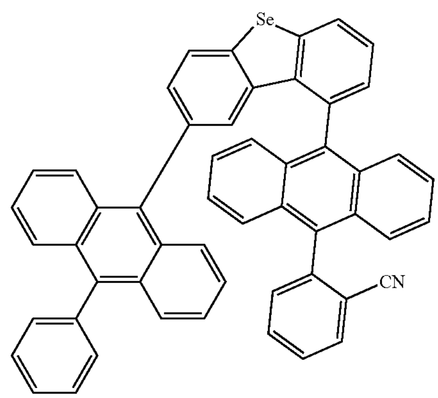
1647
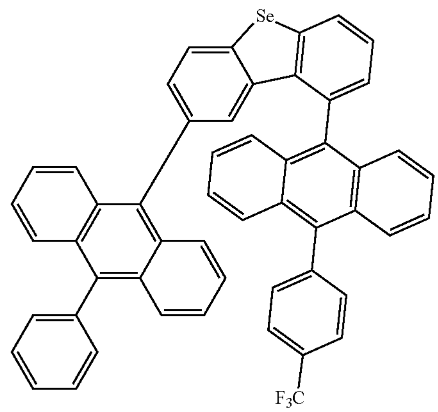

-continued
1648
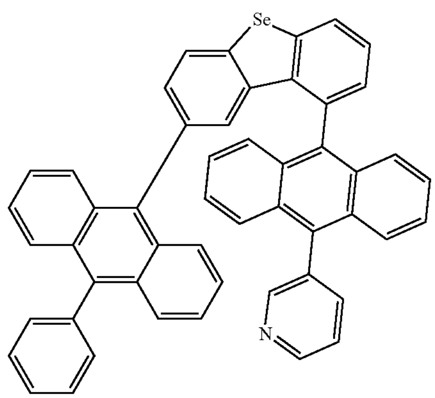
1649
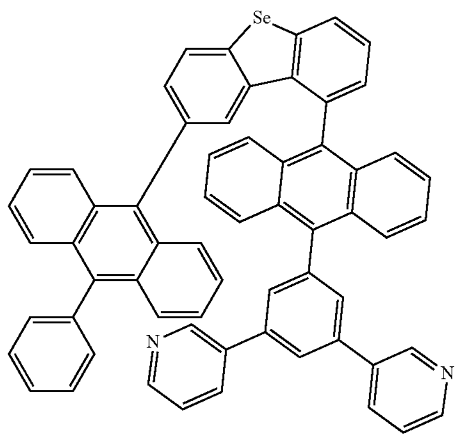
1650
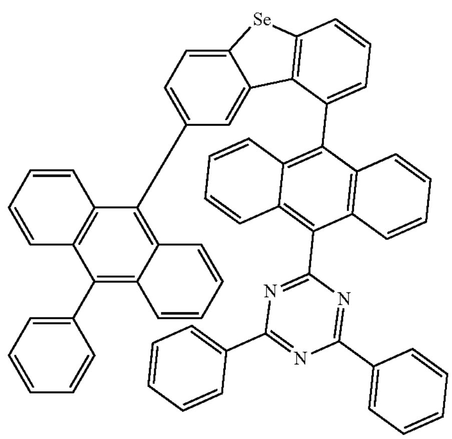
-continued
1651
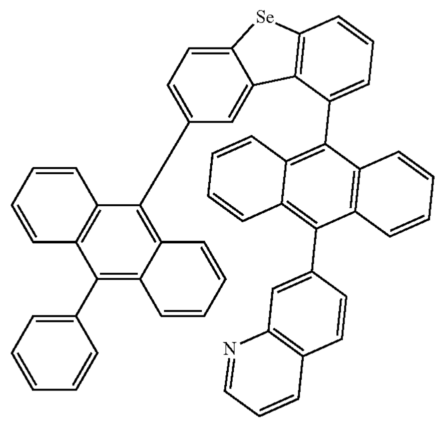
1652
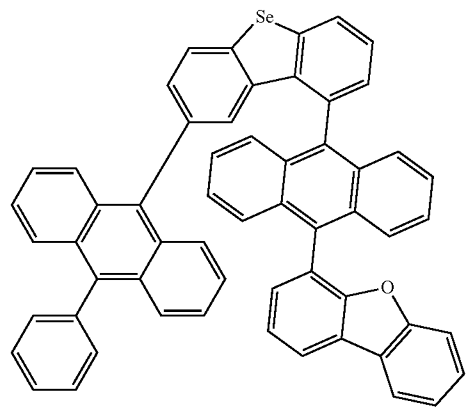
1653
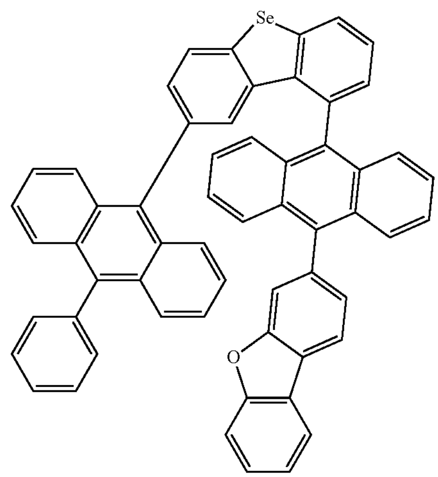

-continued
1654
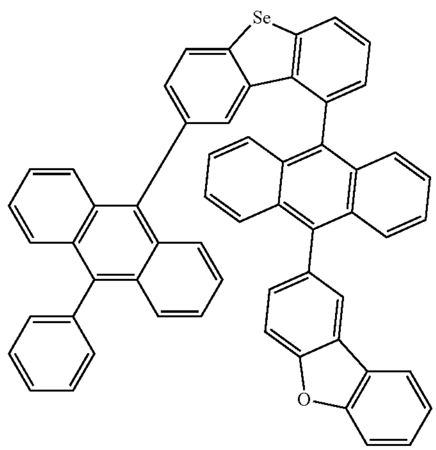
1655
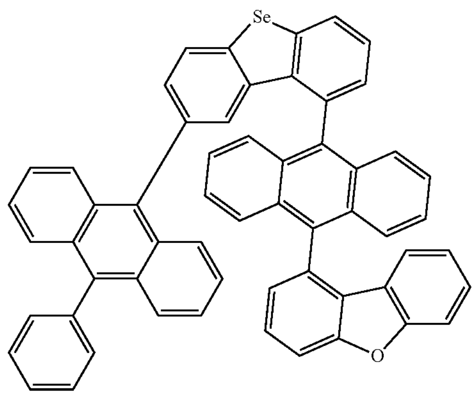
1656
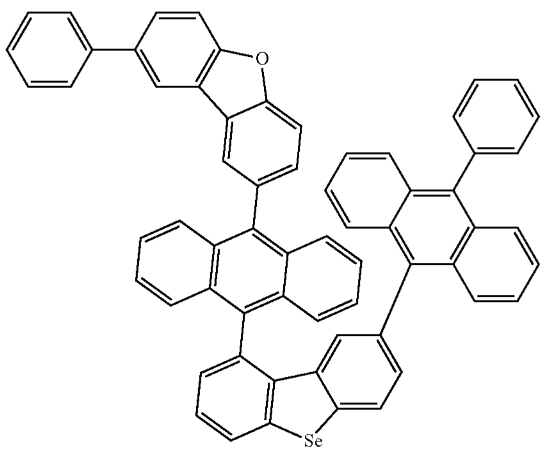
-continued
1657
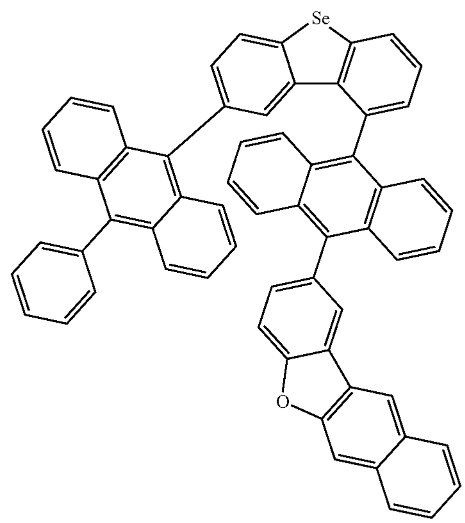
1658
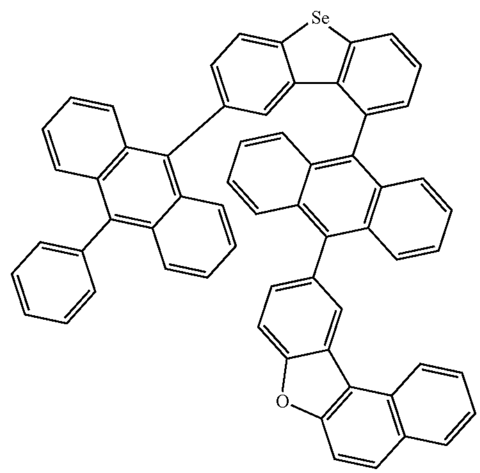
1659
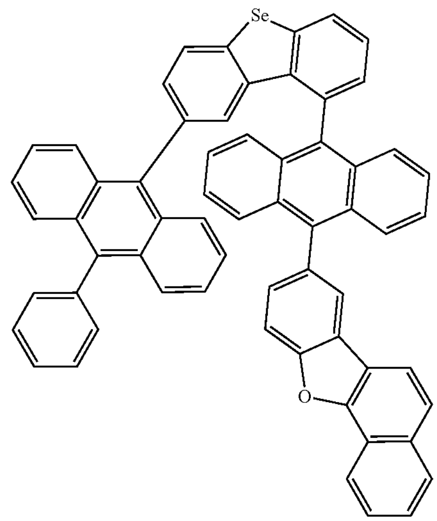

-continued
1660
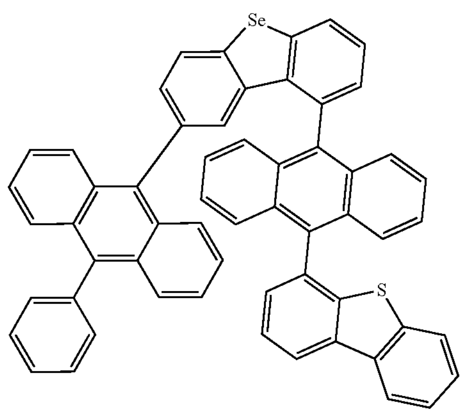
1661
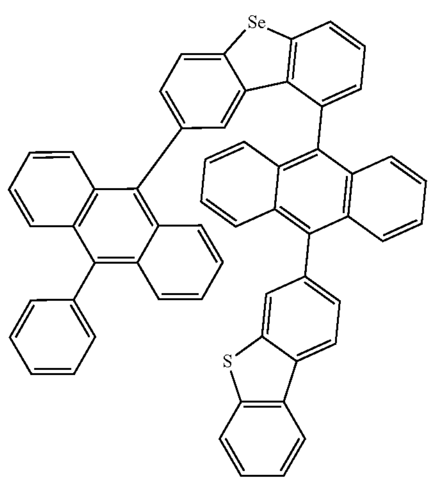
1662
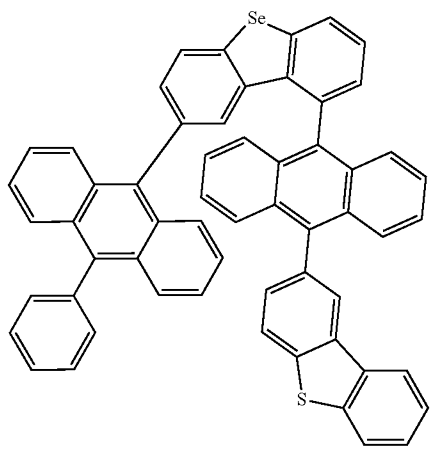
-continued
1663
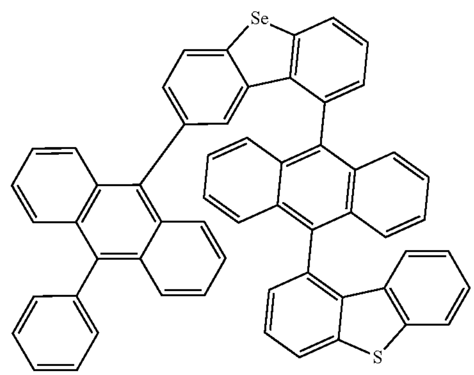
1664
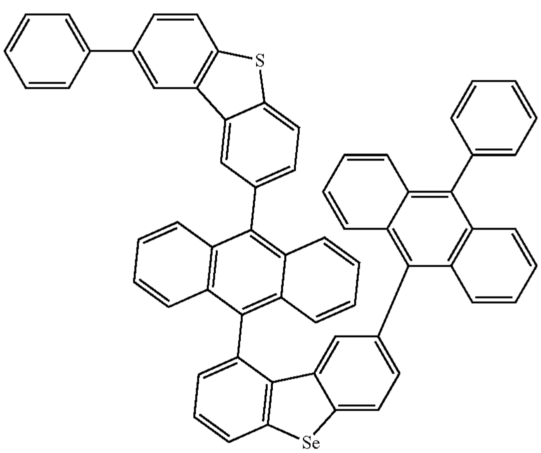
1665
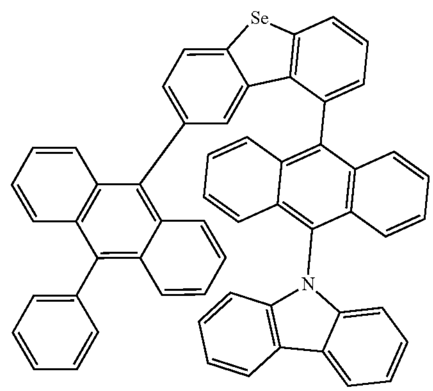

-continued
1666
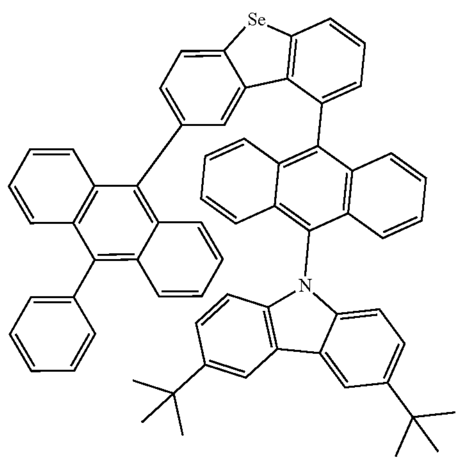
1667
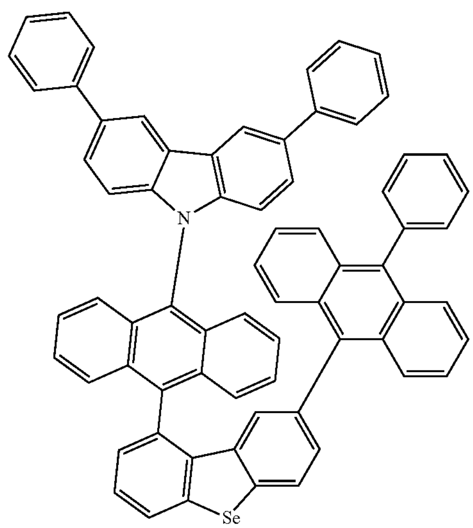
1668
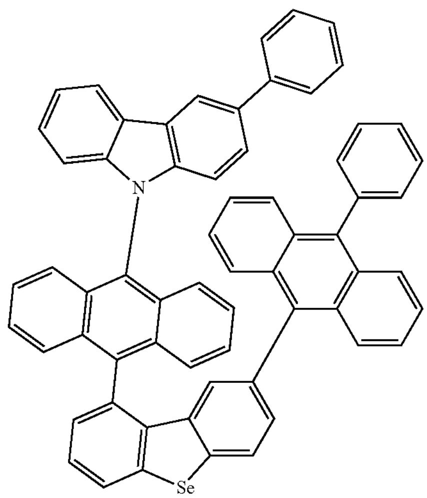
-continued
1669
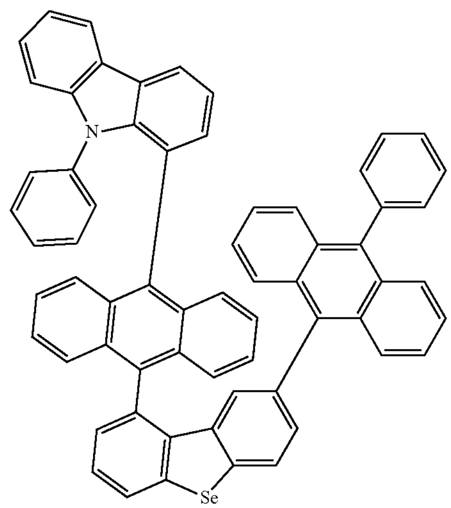
1670
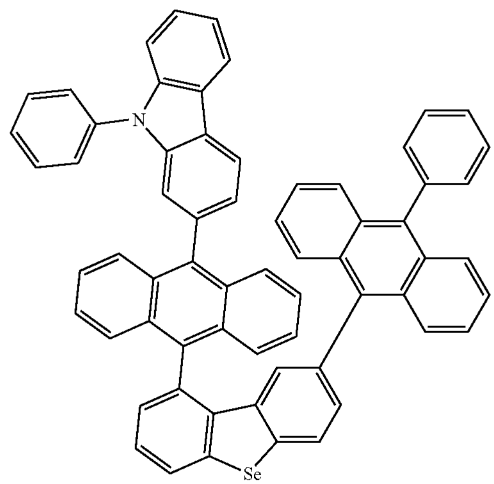
1671
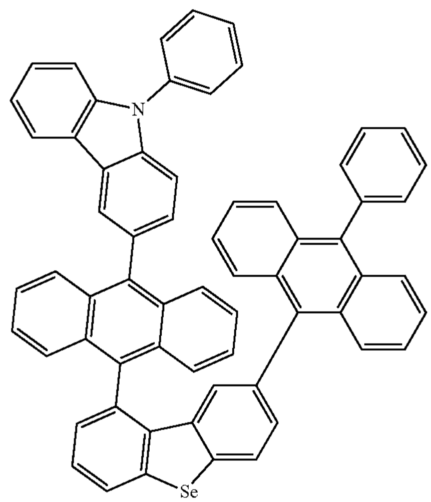

1672
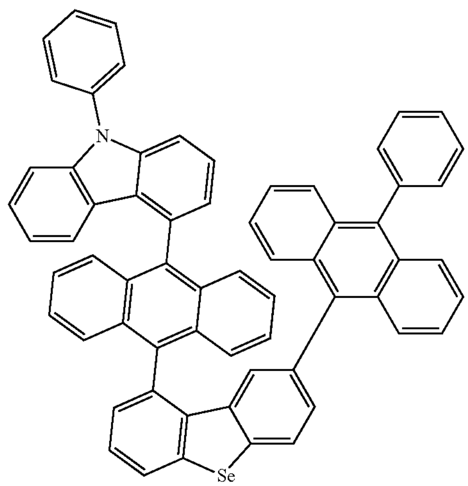
1673
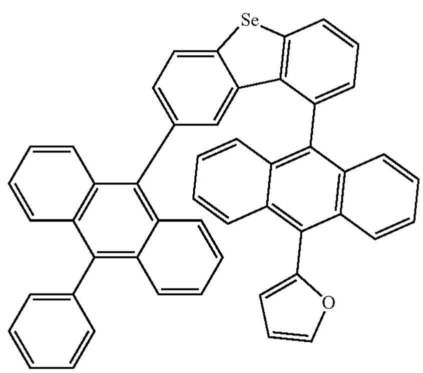
1674
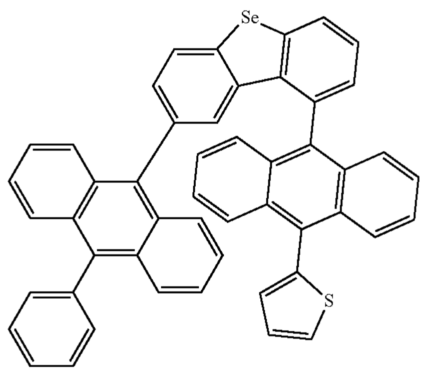
1675
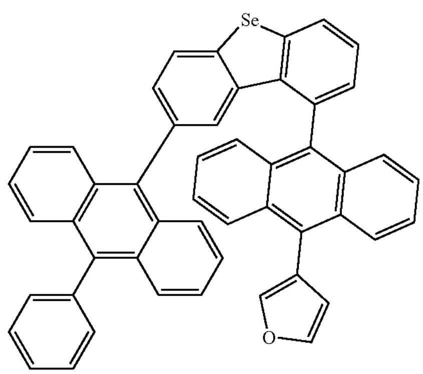
1676
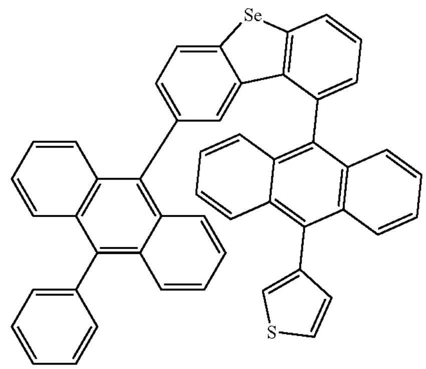
1677
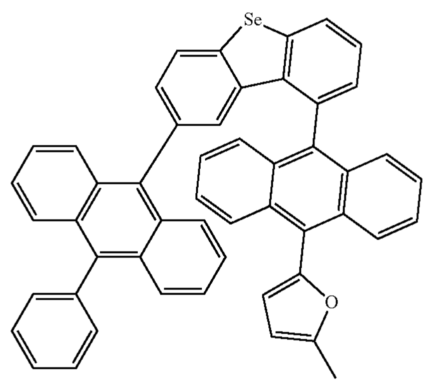
1678
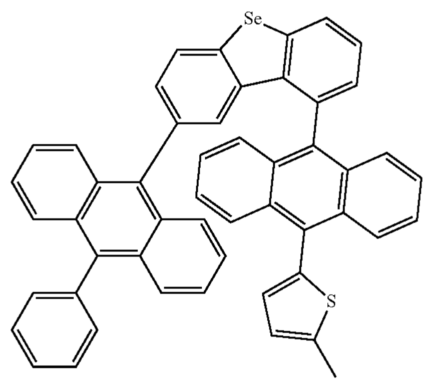
1679
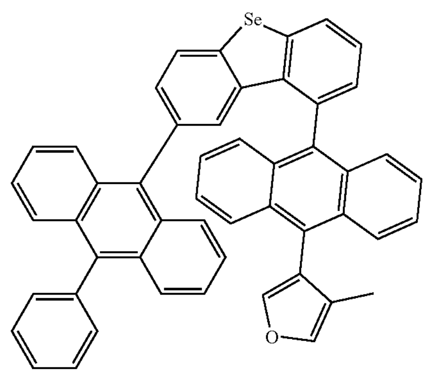

-continued
1680
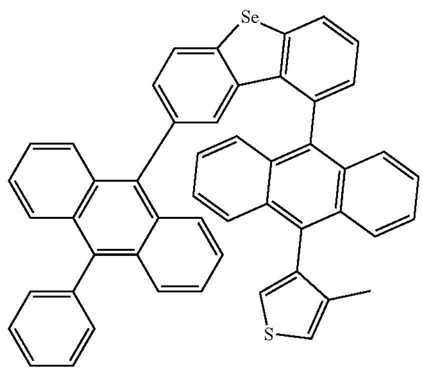
1681
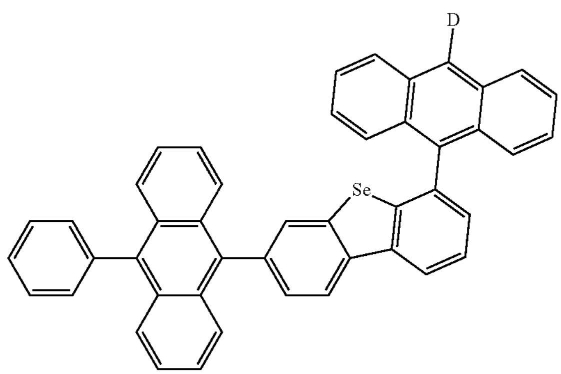
1682
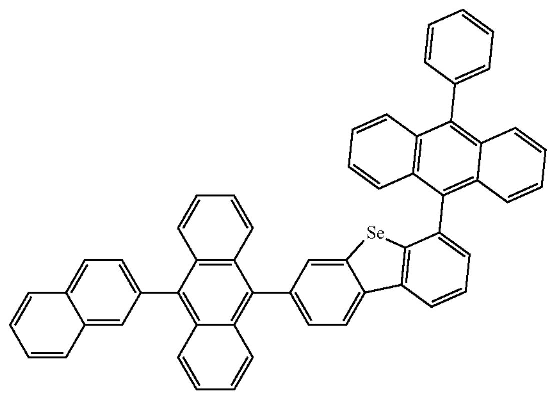
1683
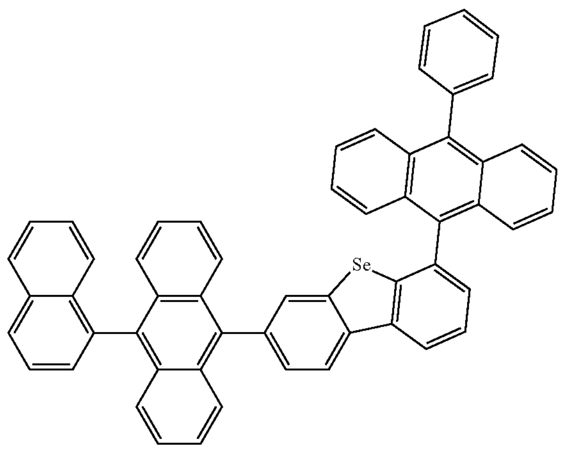
-continued
1684
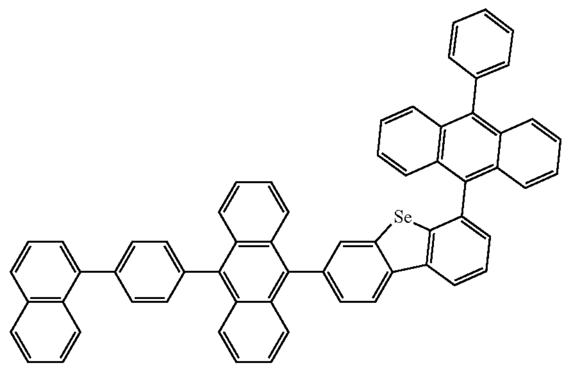
1685
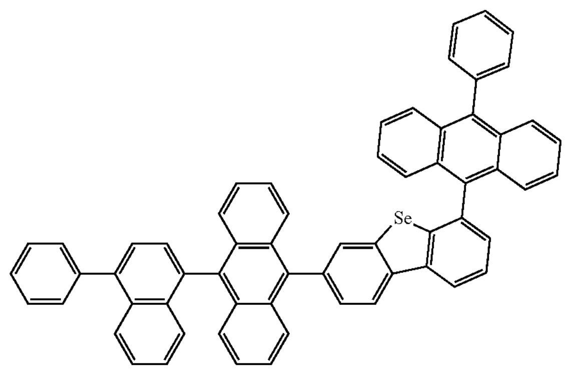
1686
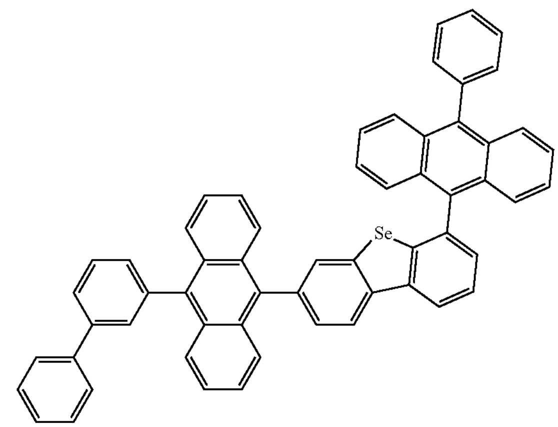

-continued
1687
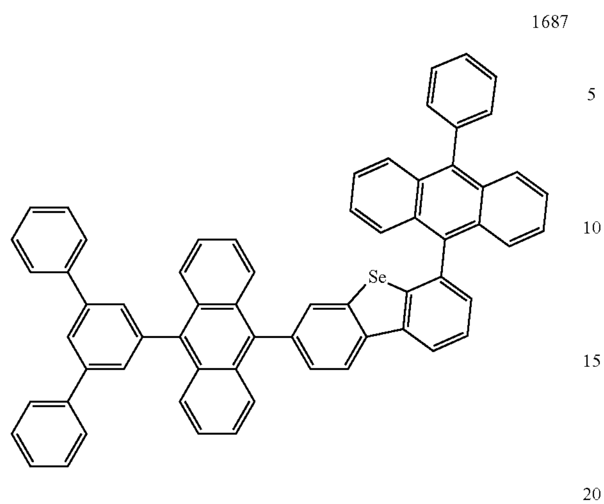
1688
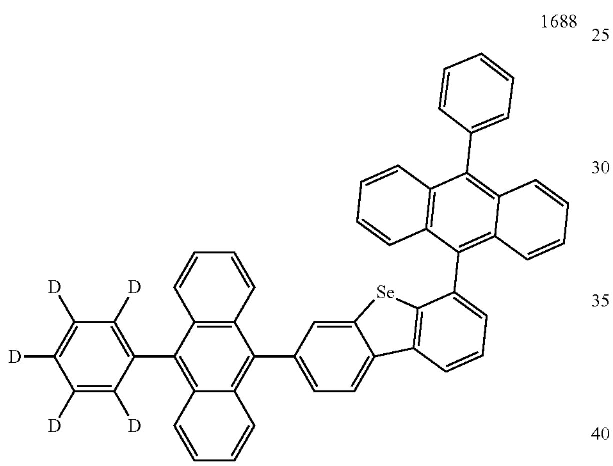
1689
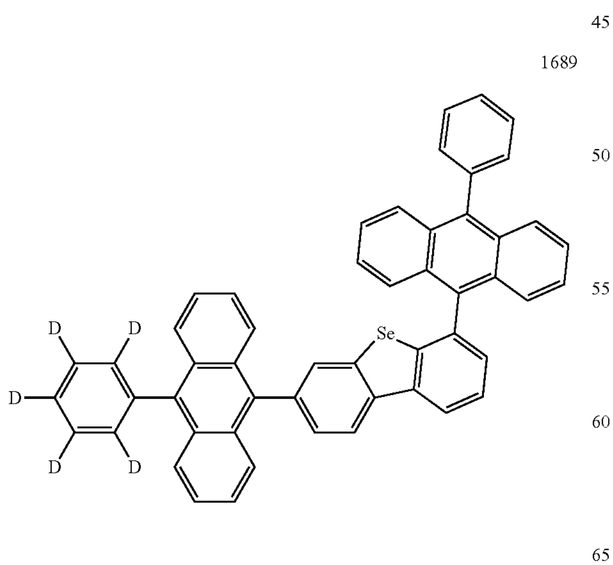
1690
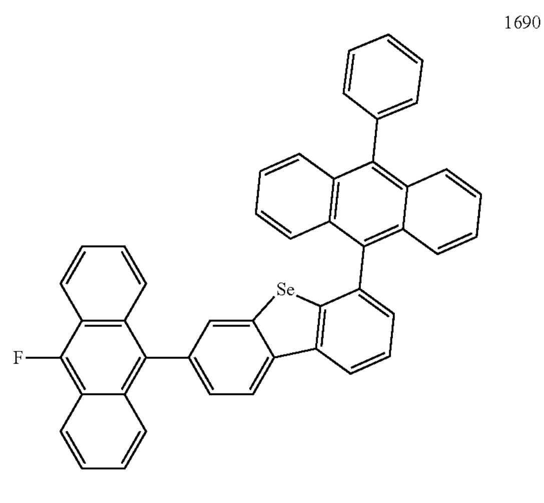
1691
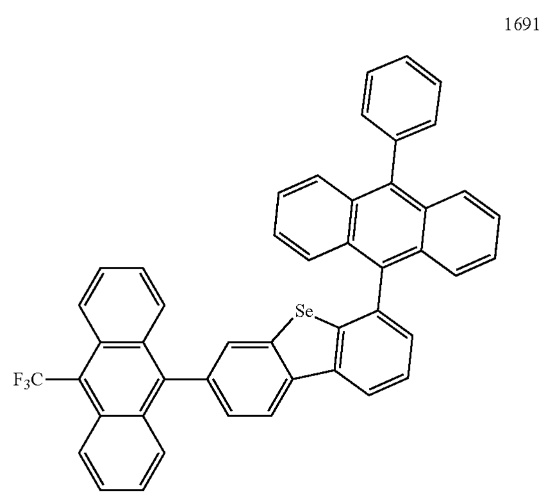
1692
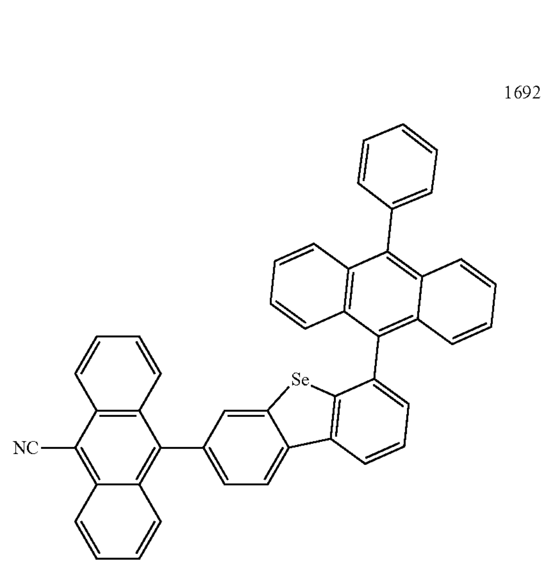

-continued
1693
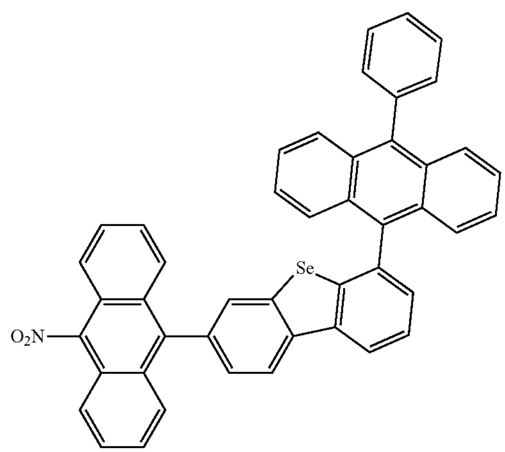
1694
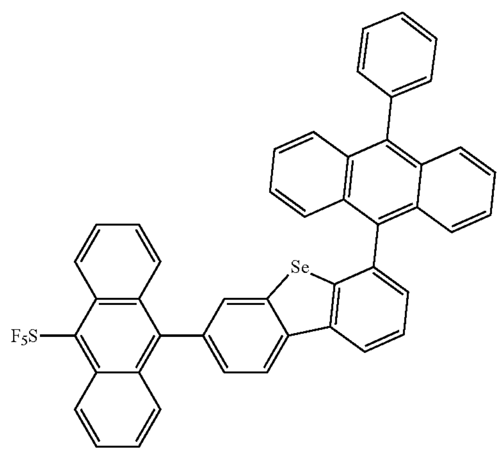
1695
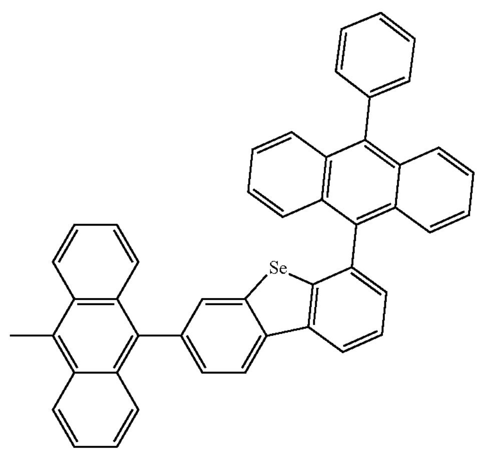
-continued
1696
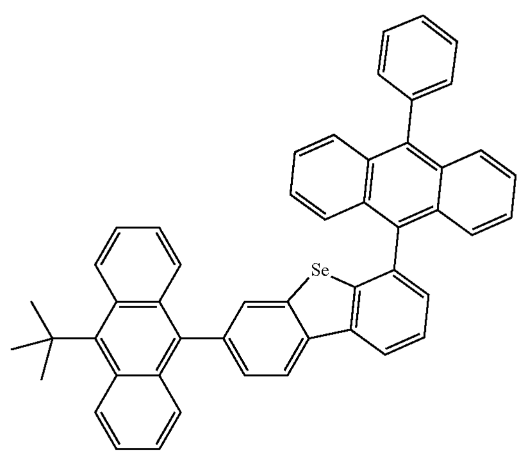
1697
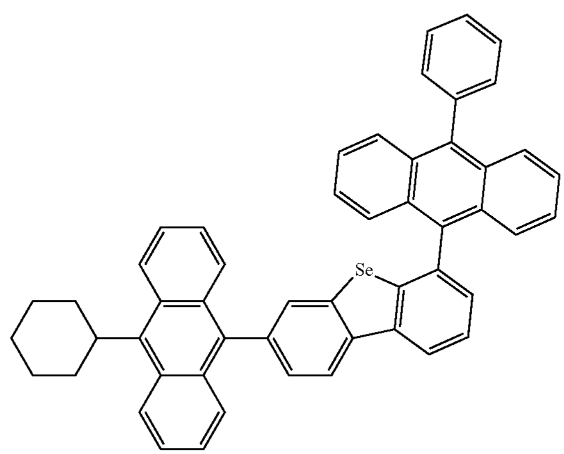
1698
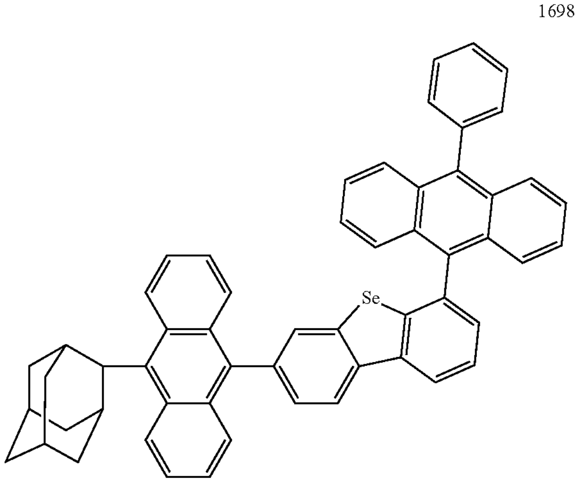

-continued
1699
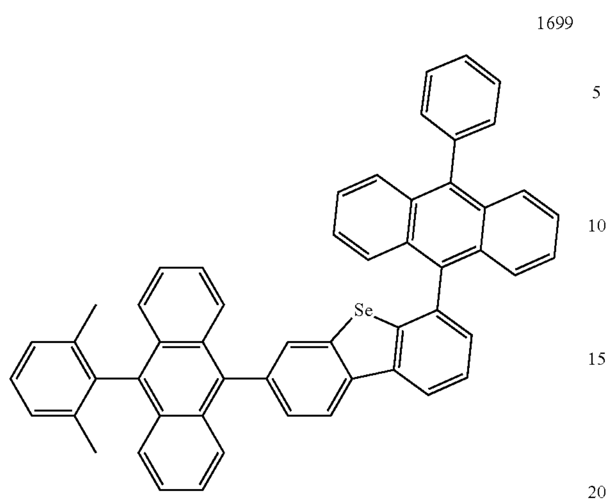
1700
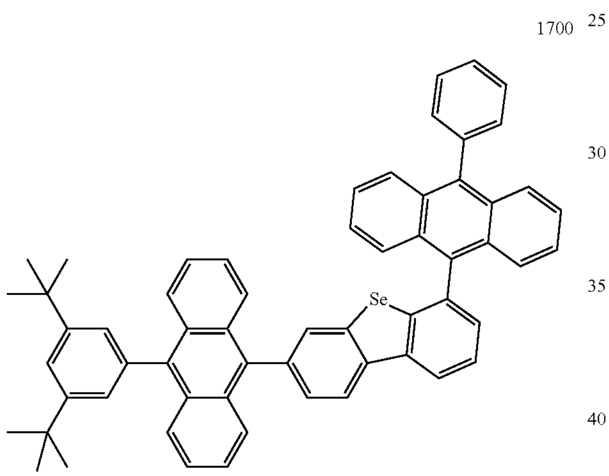
1701
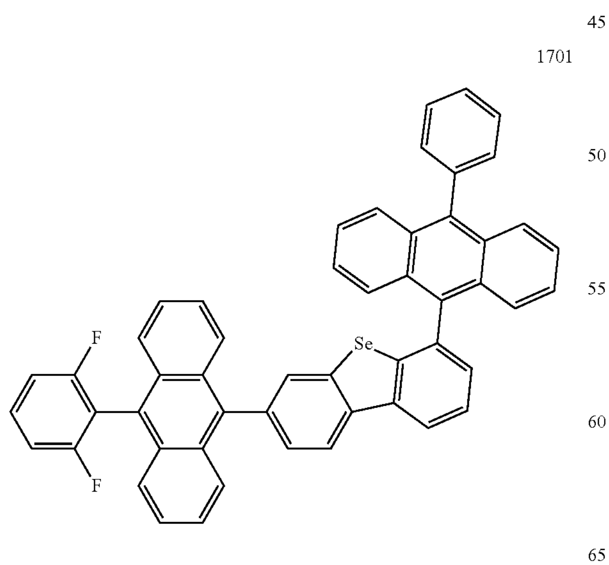
-continued
1702
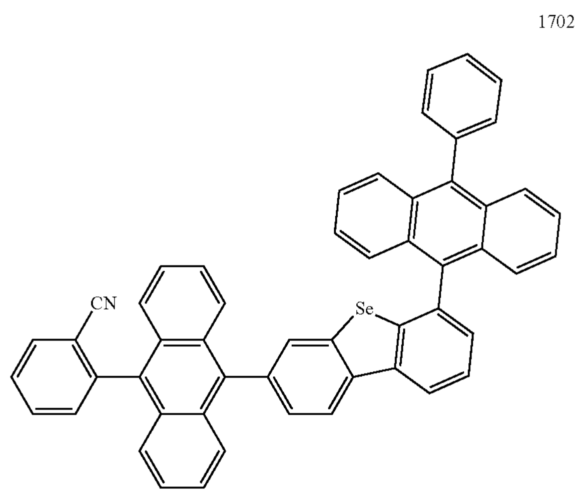
1703
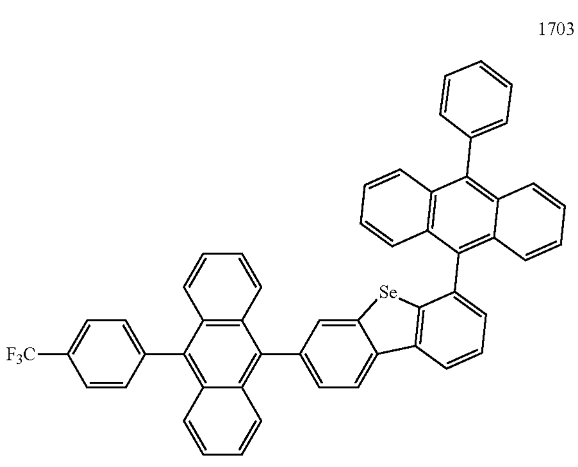
1704
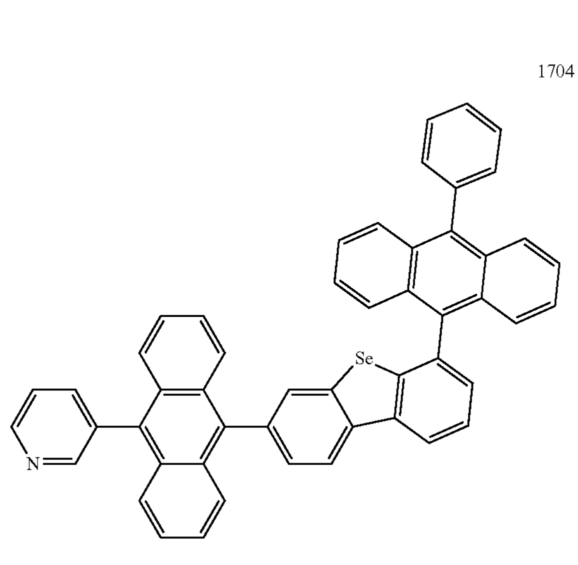

-continued
1705
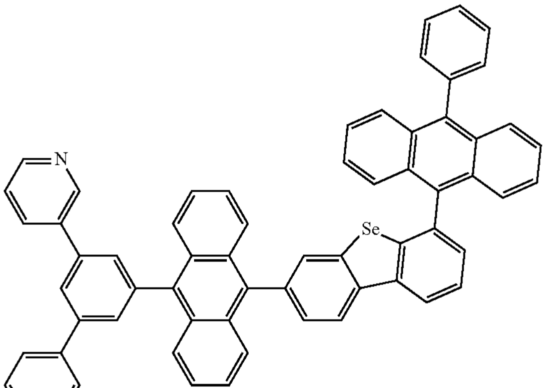
1706
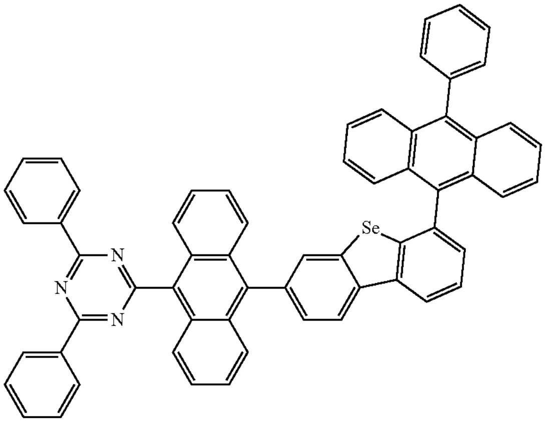
1707
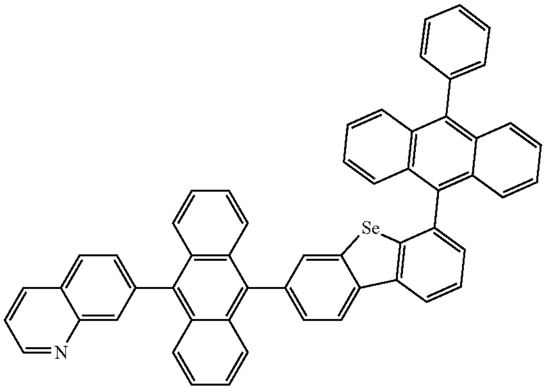
-continued
1708
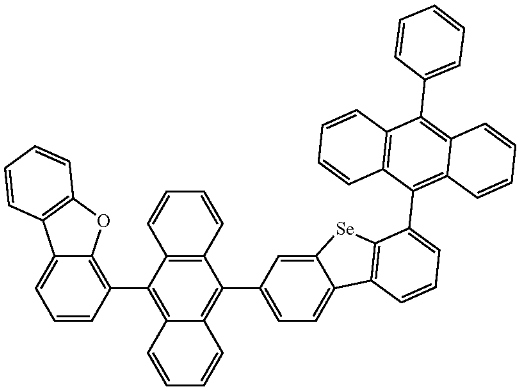
1709
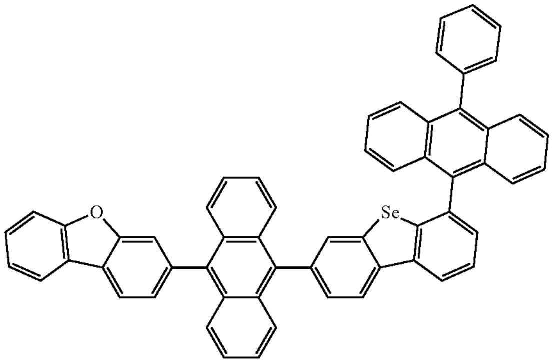
1710
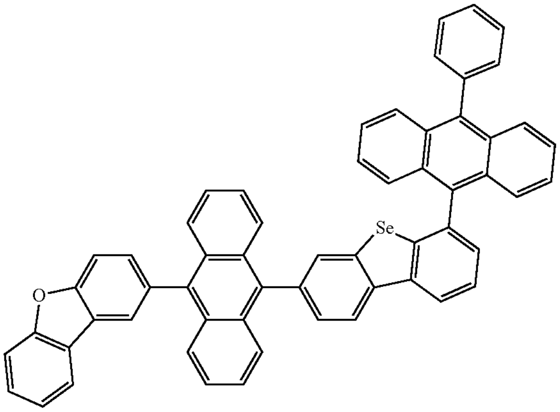

-continued
1711
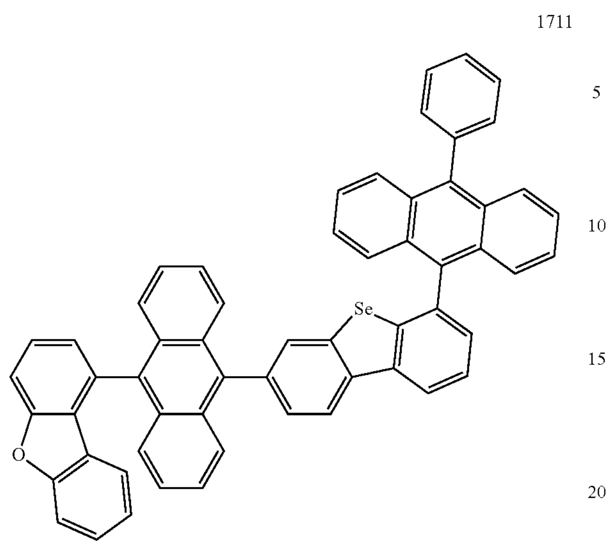
1712
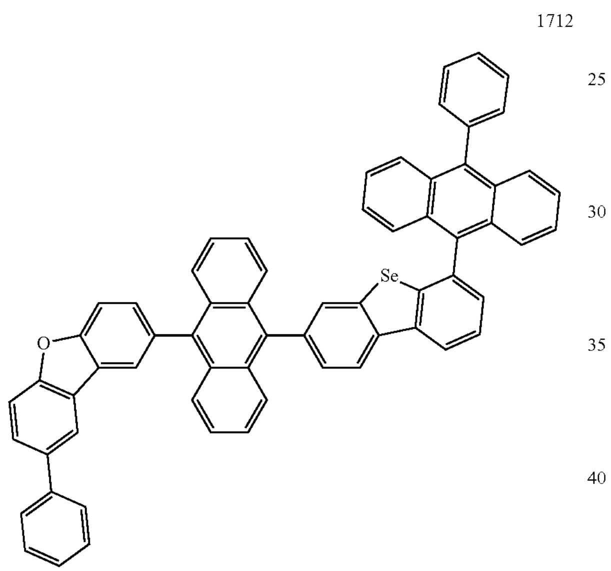
1713
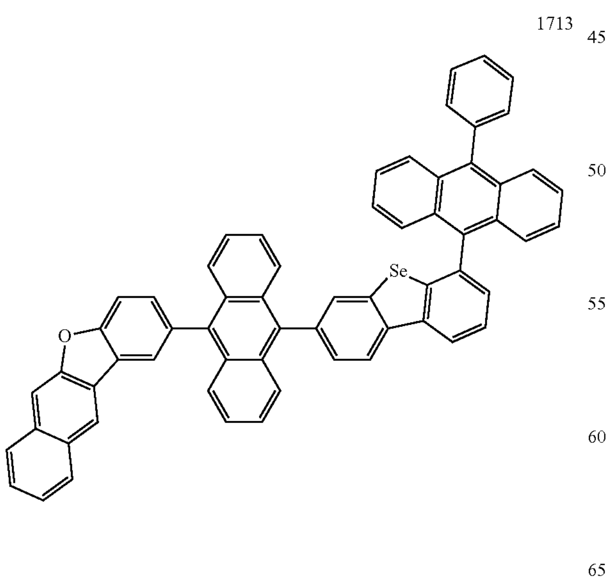
-continued
1714
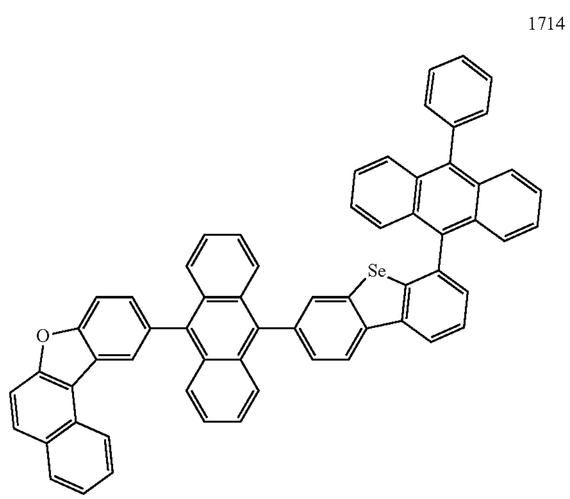
1715
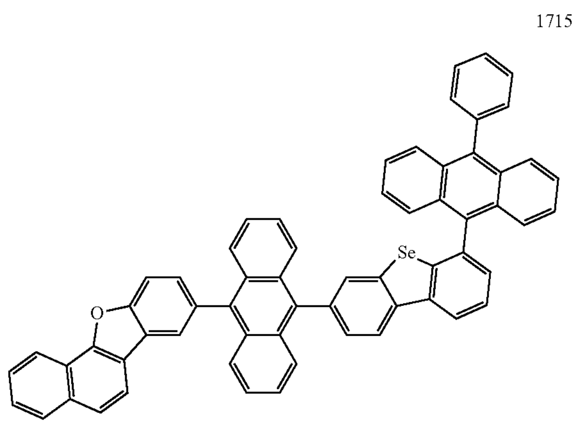
1716
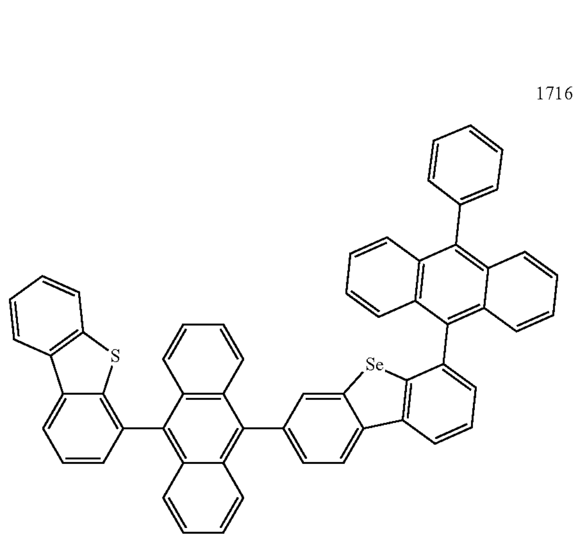

-continued
1717
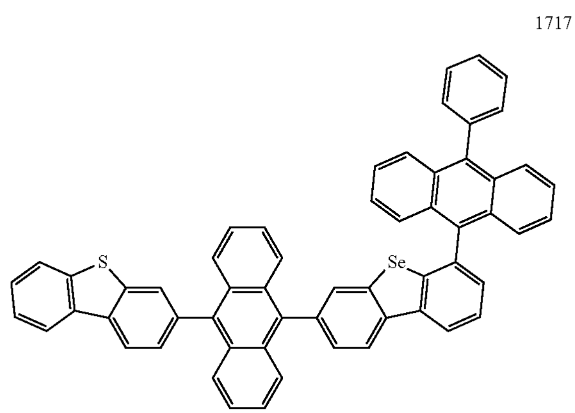
1718
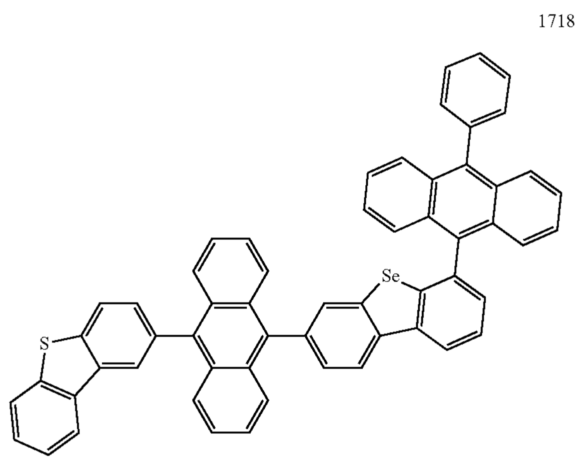
1719
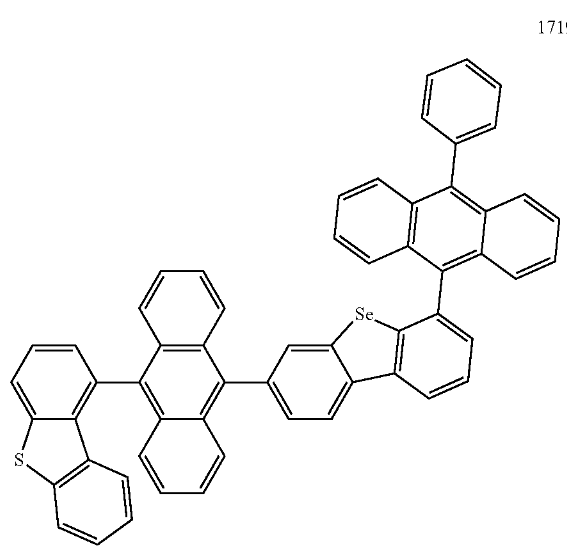
-continued
1720
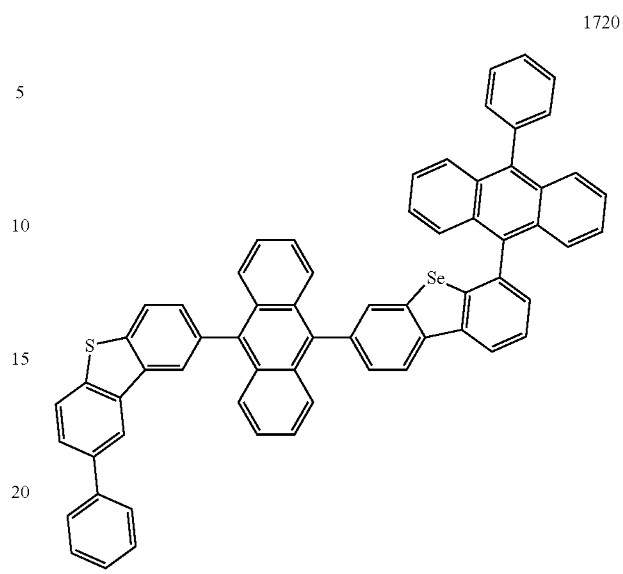
1721
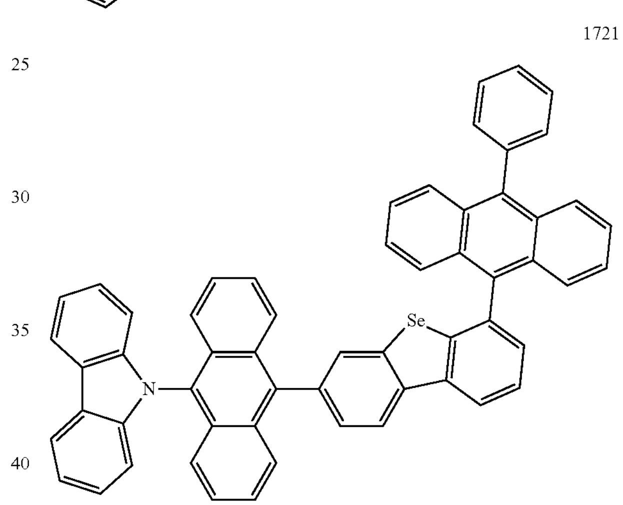
1722
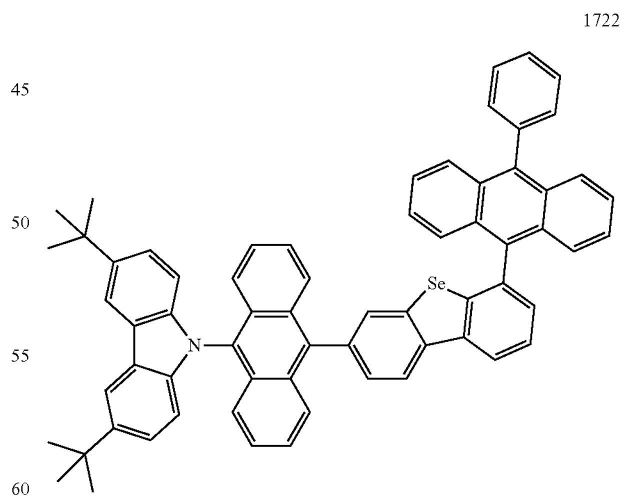

-continued
1723
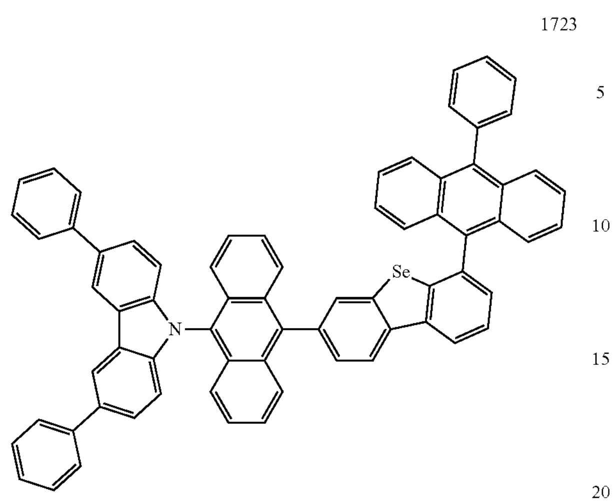
1724
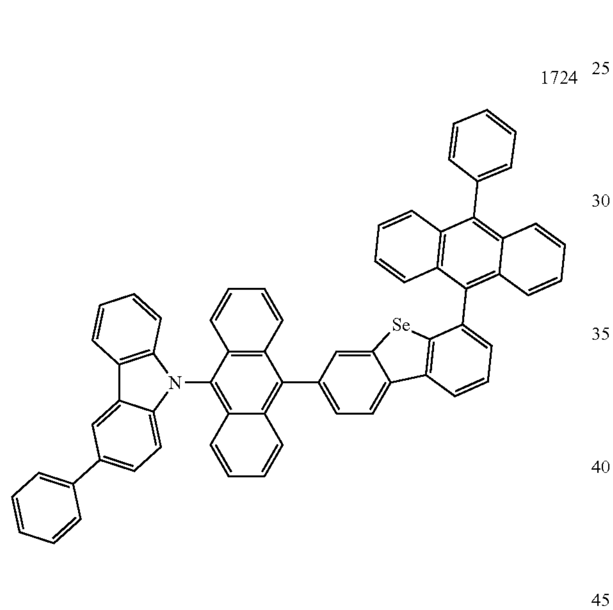
1725
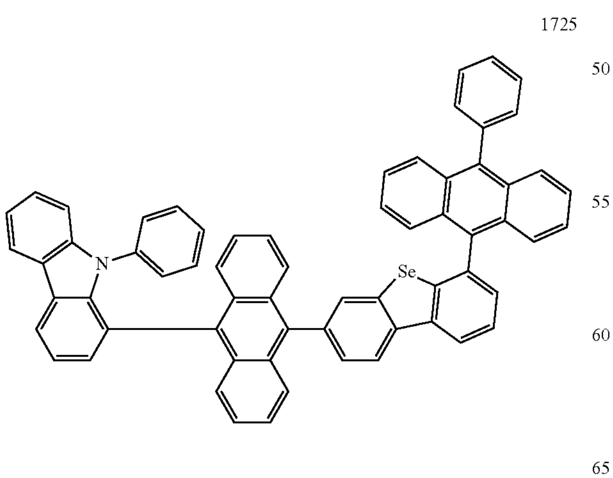
-continued
1726
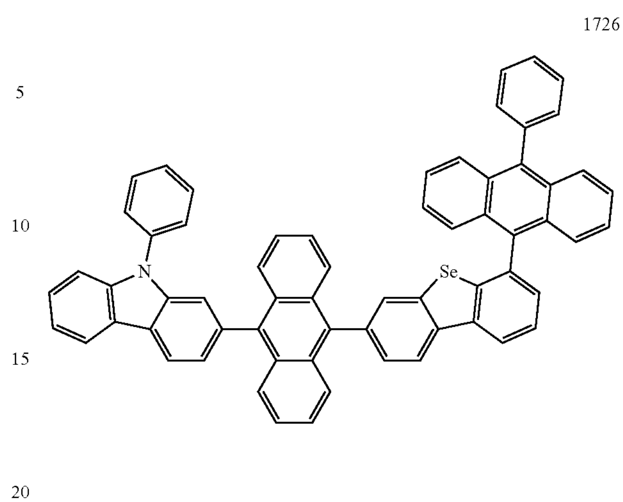
1727
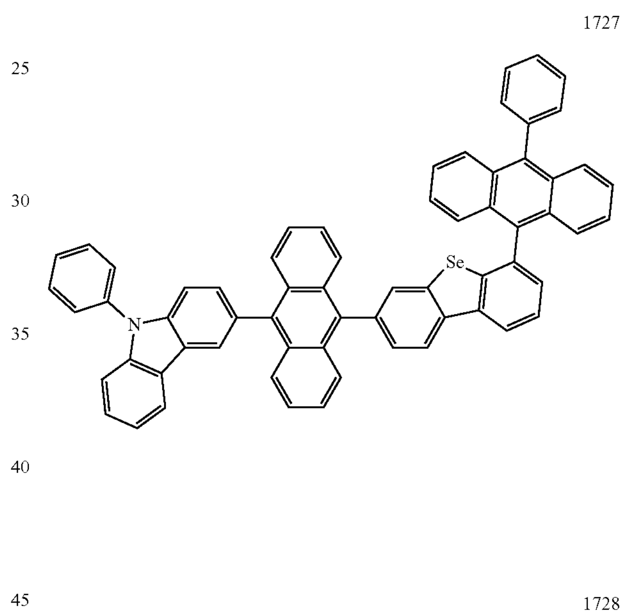
1728
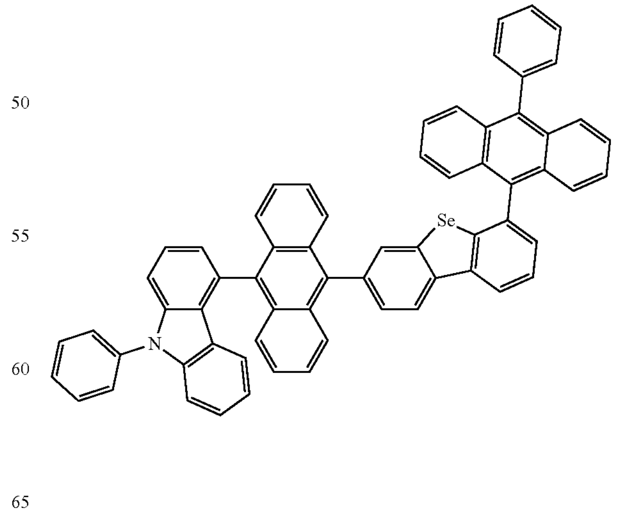

-continued
1729
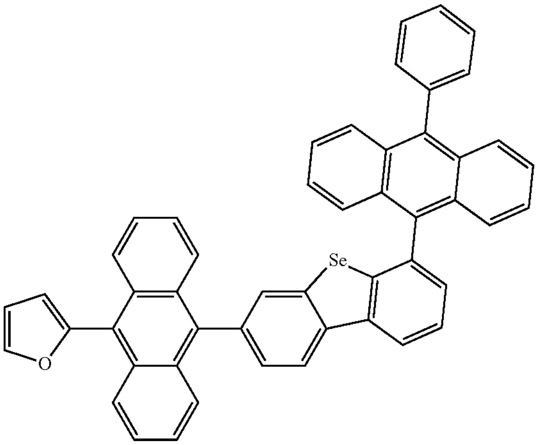
1730
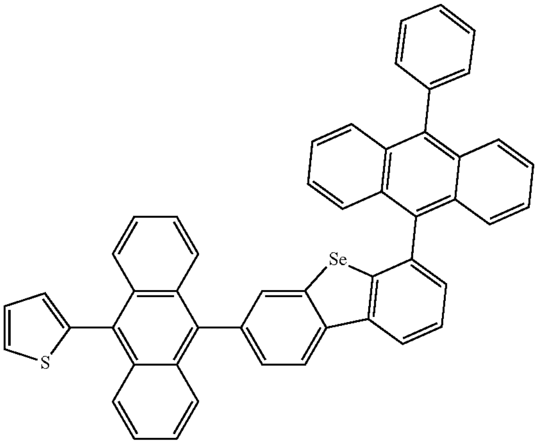
1731
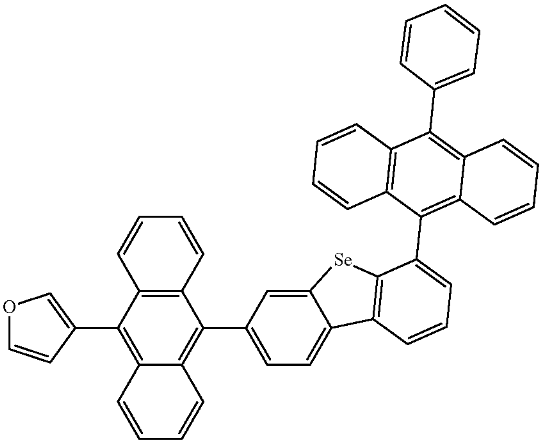
-continued
1732
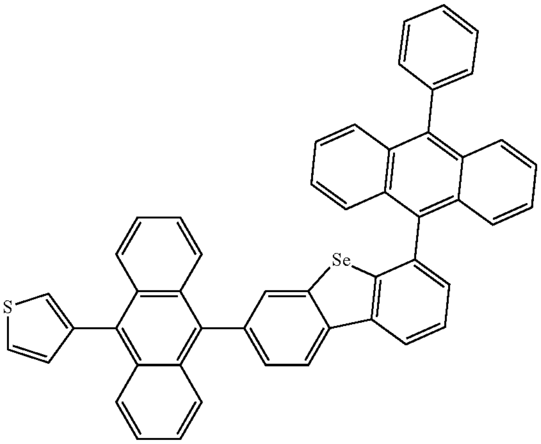
1733
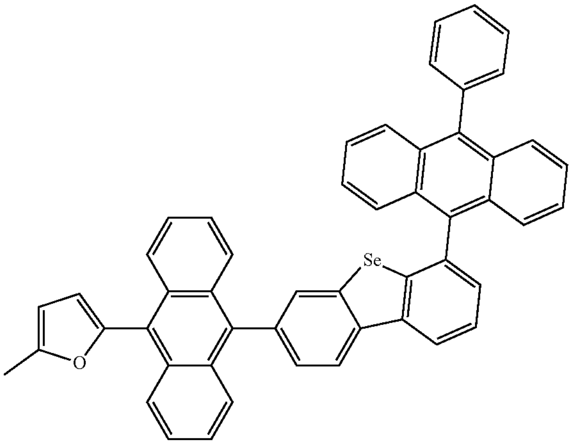
1734
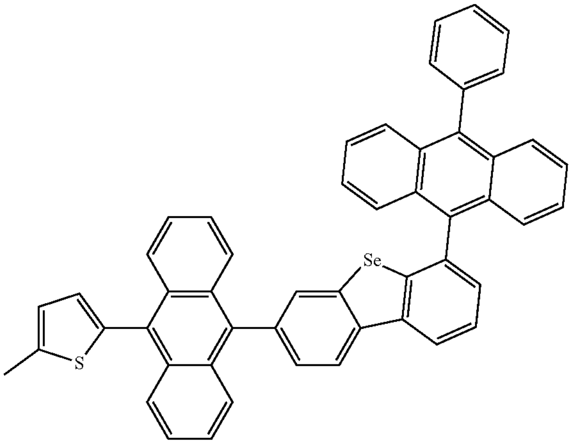

-continued
1735
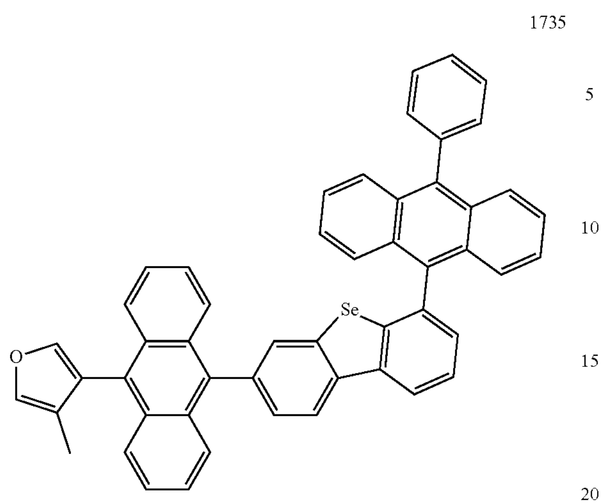
1736
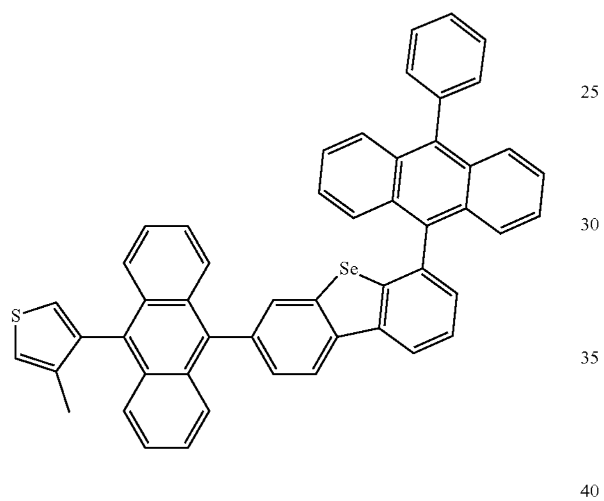
1737
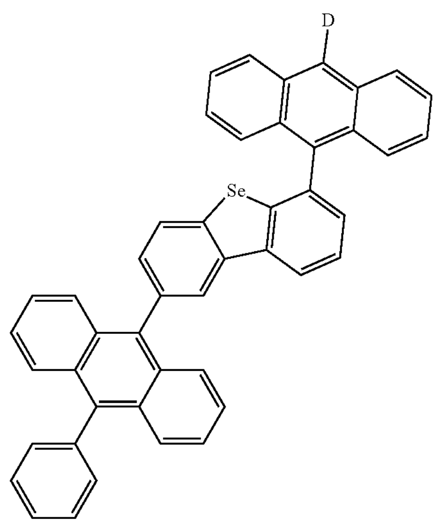
-continued
1738
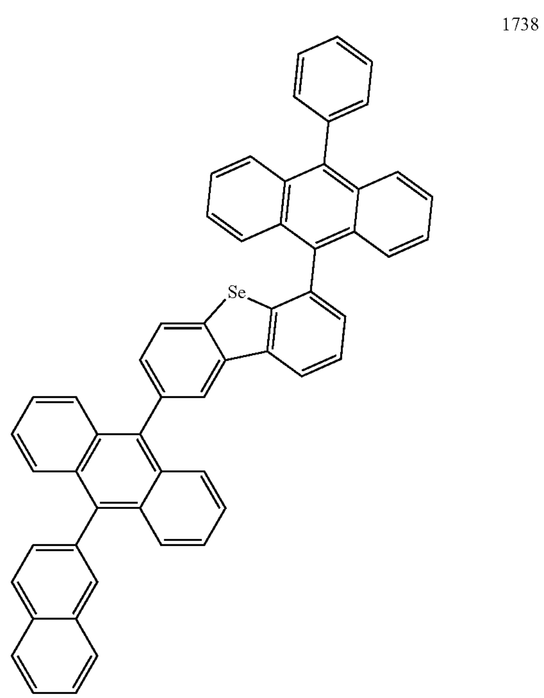
1739
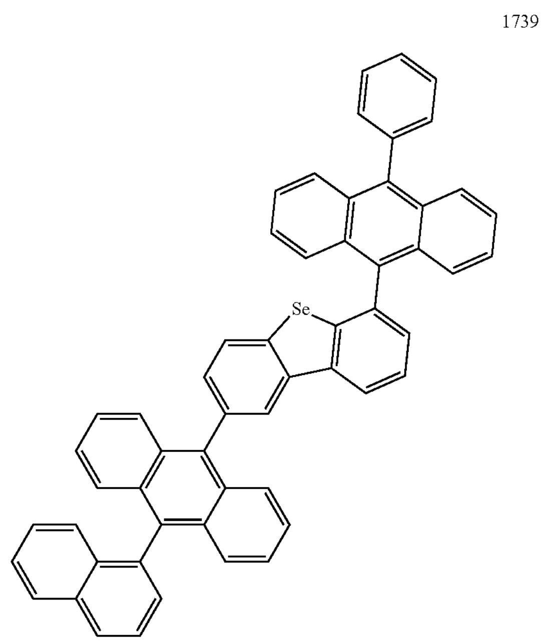

-continued
1740
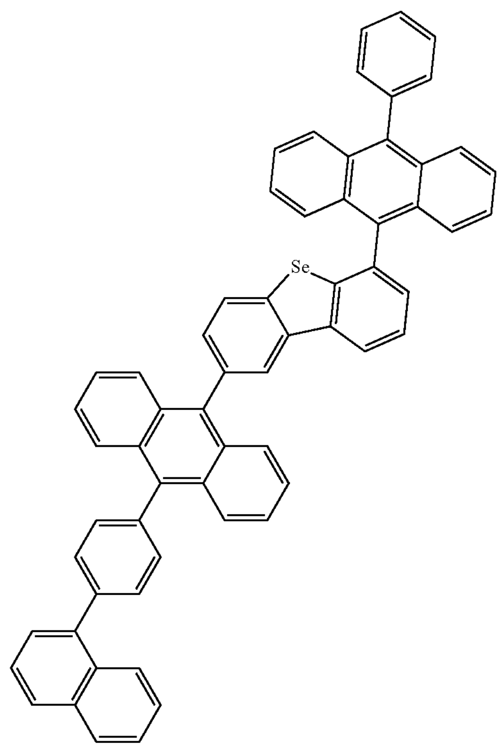
1741
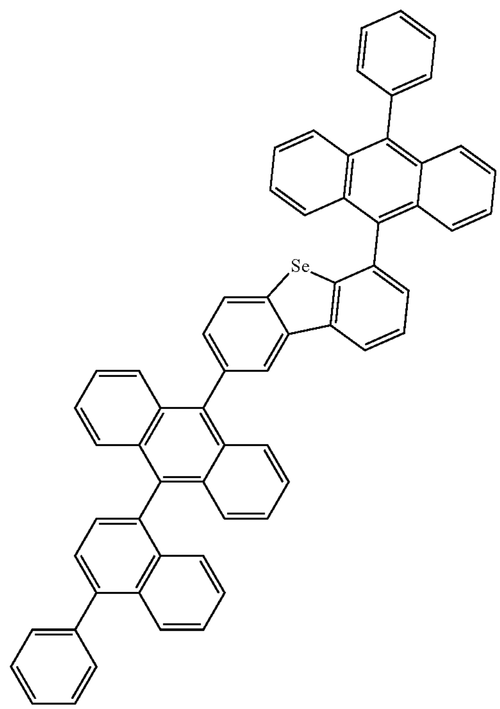
-continued
1742
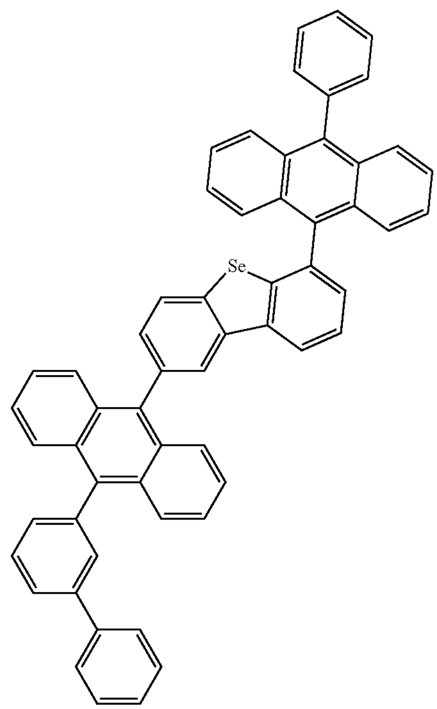
1743
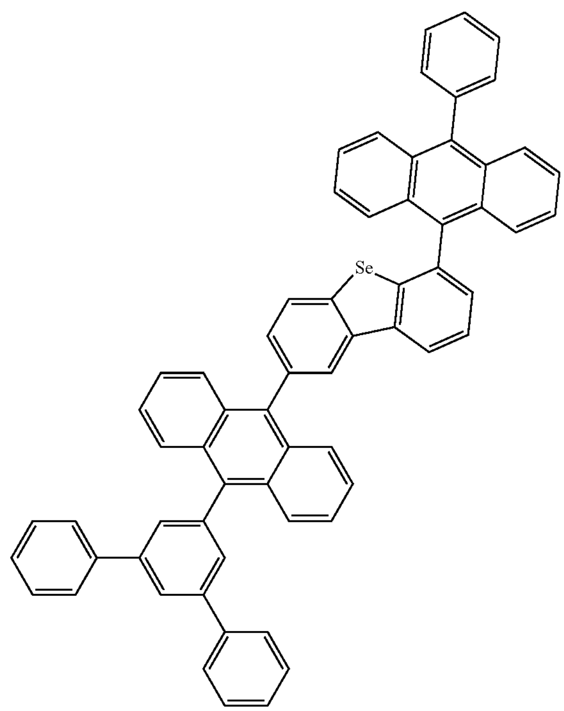

-continued
1744
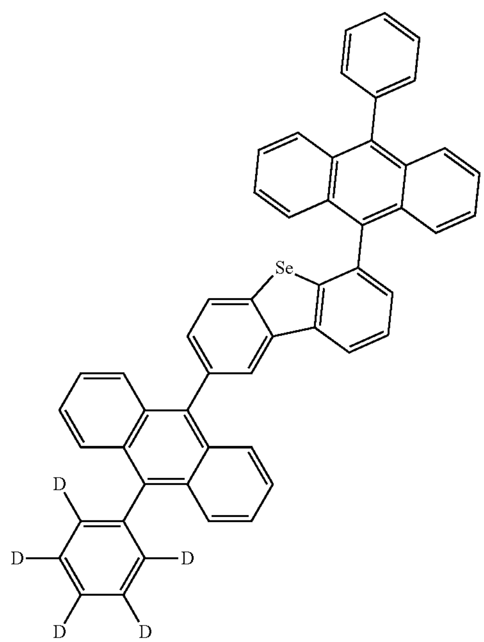
1745
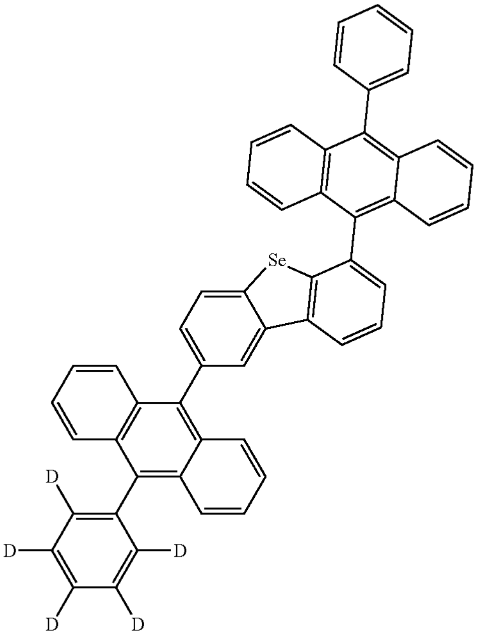
-continued
1746
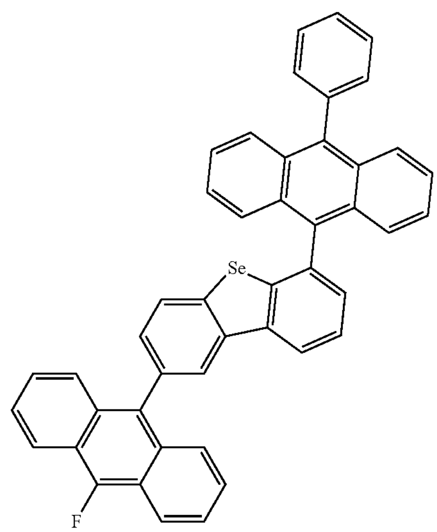
1747
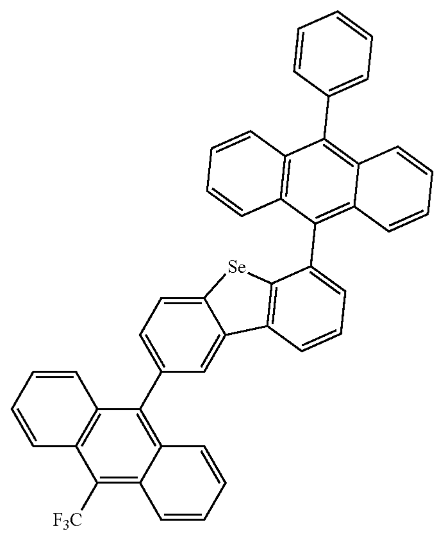
1748
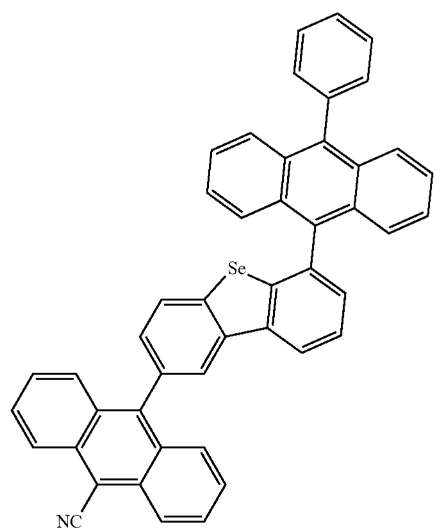

1449
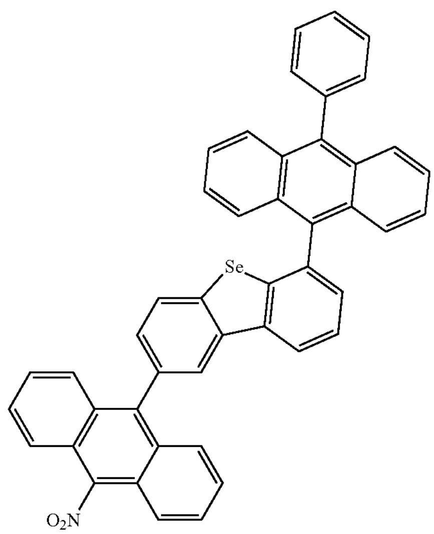
1750
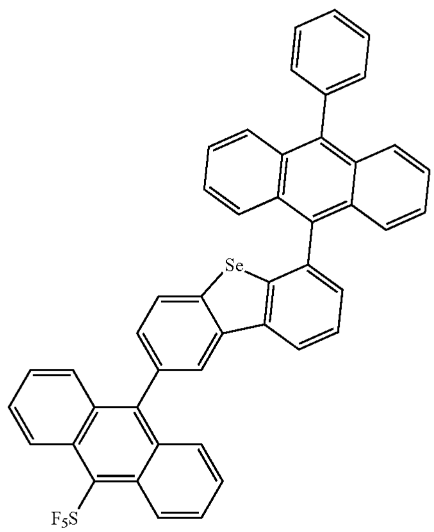
1751
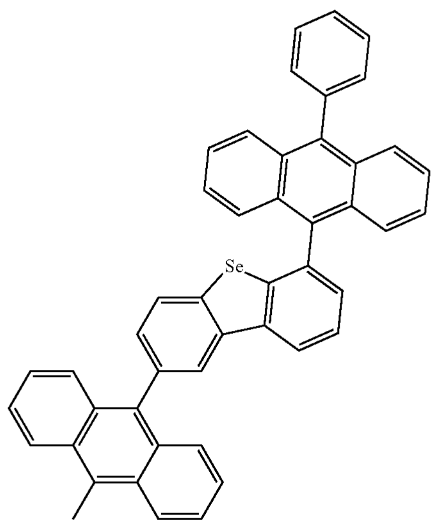
1752
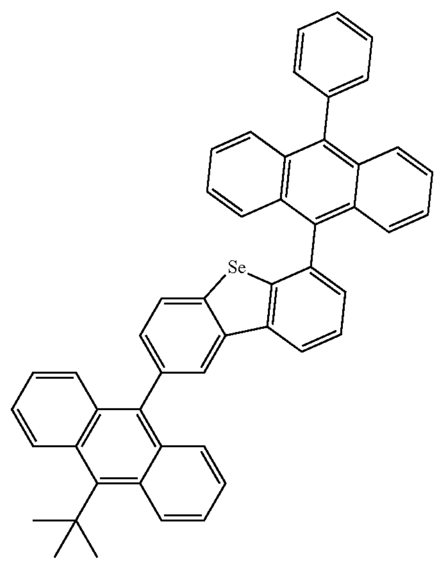
1753
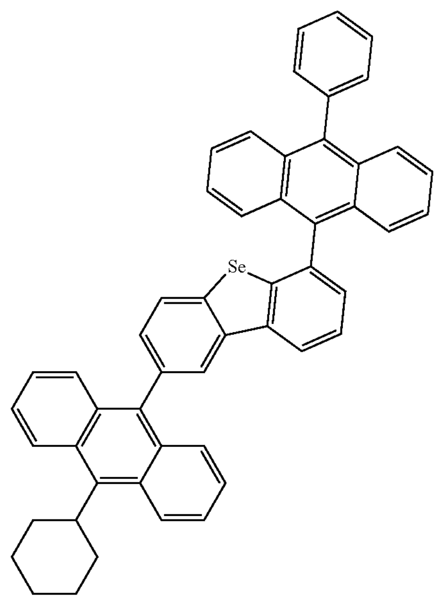
1754
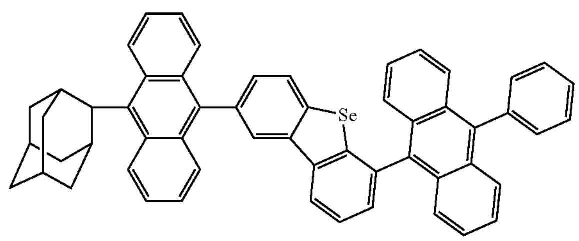

-continued
1755
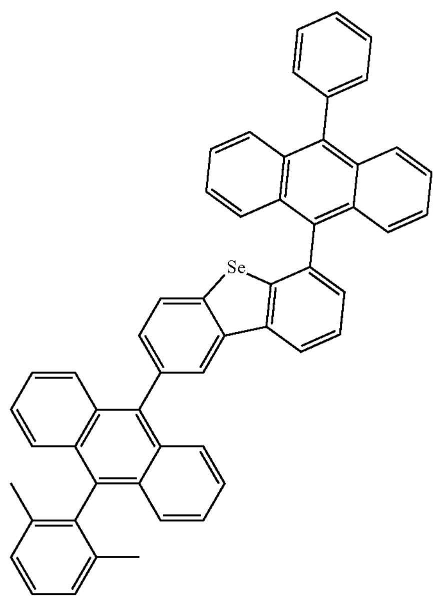
1756
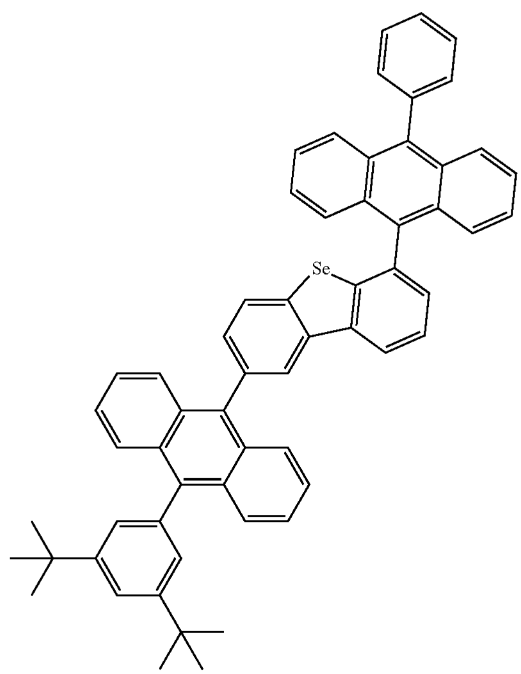
-continued
1757
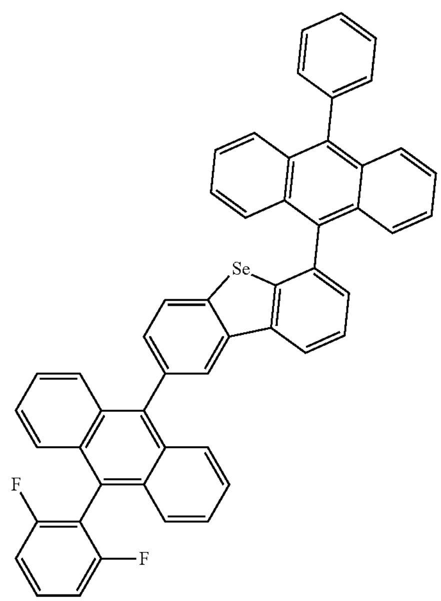
1758
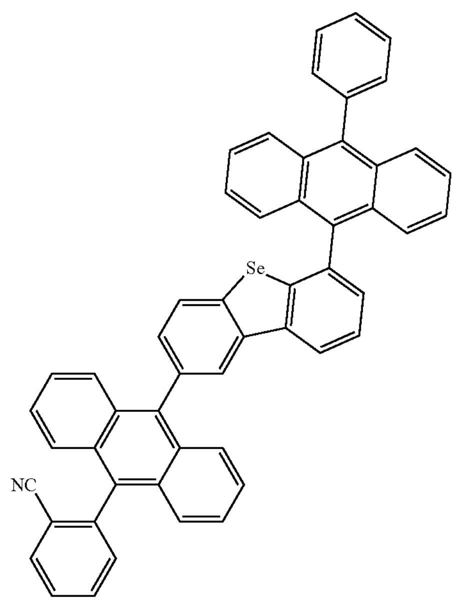

-continued
1759
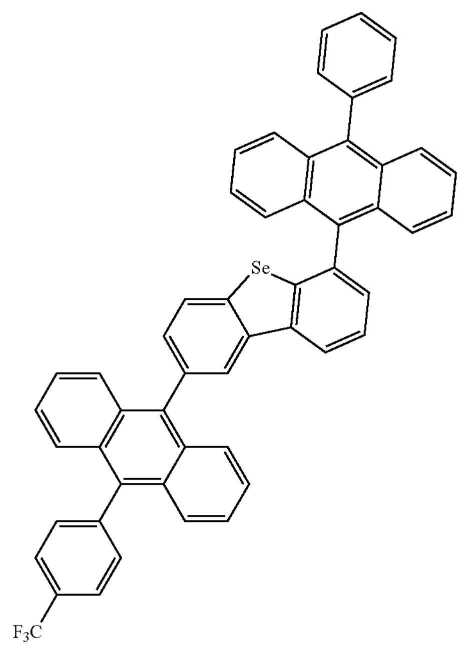
1760
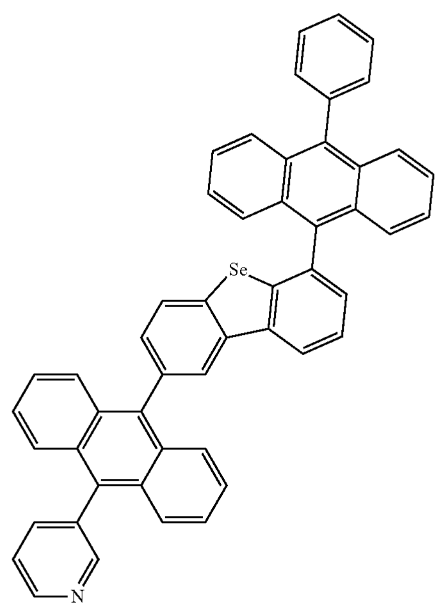
-continued
1761
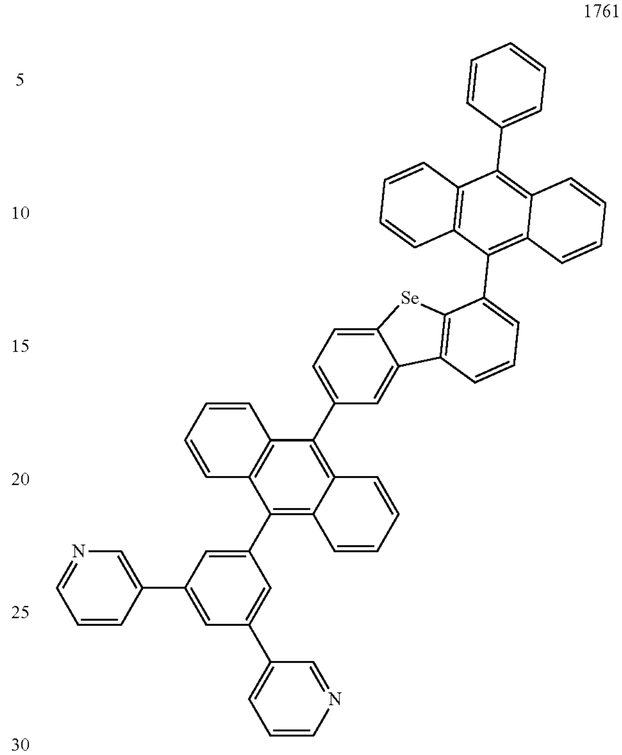
1762
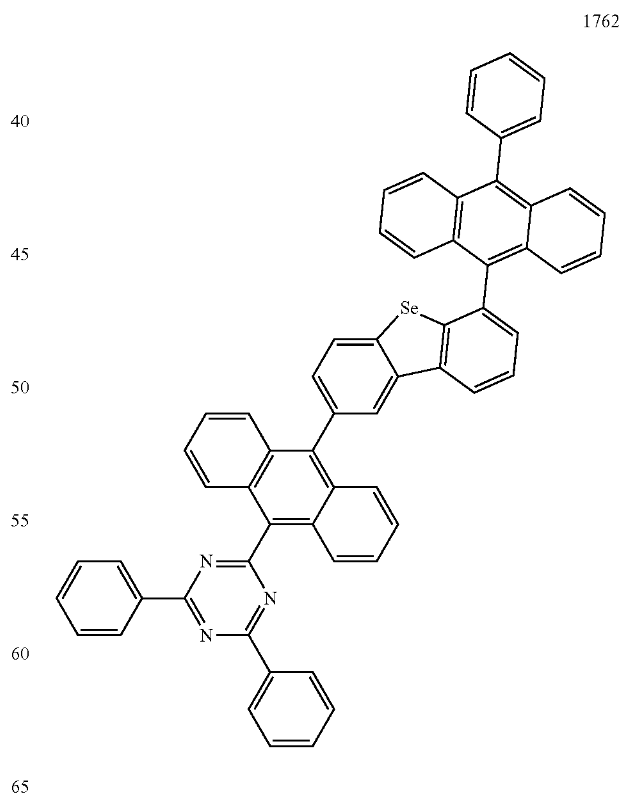

-continued
1763
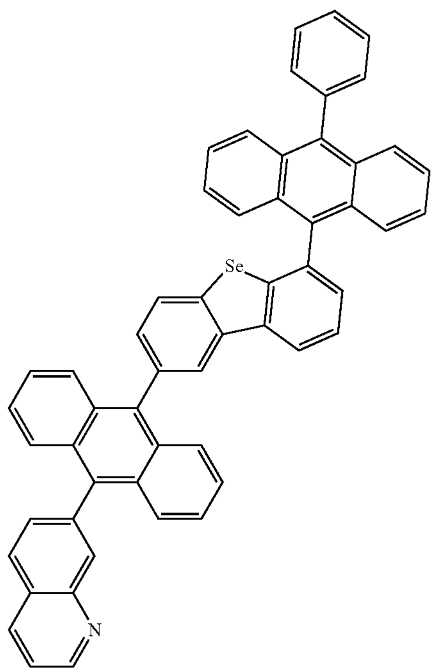
1764
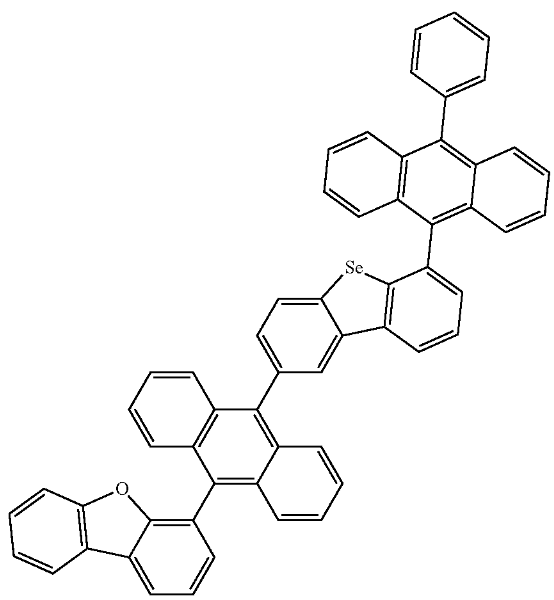
-continued
1765
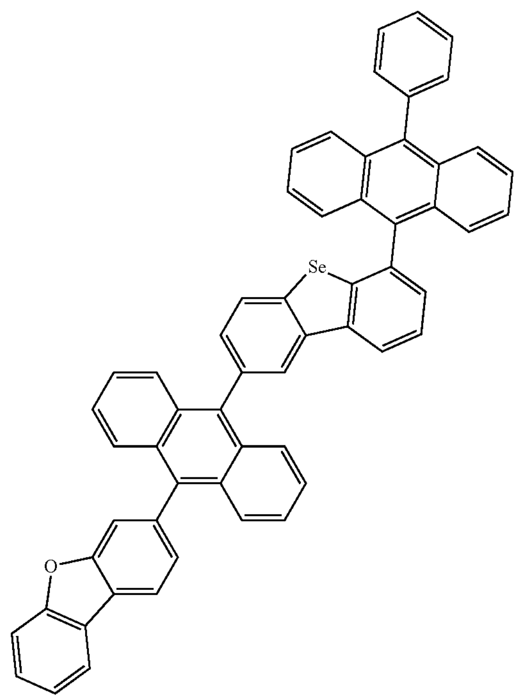
1766
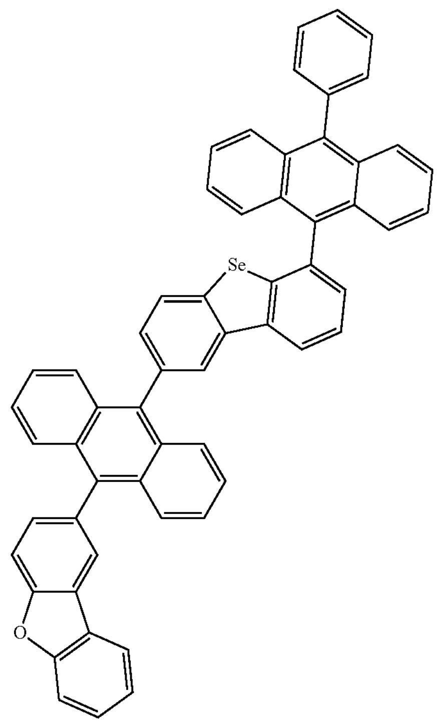

-continued
1767
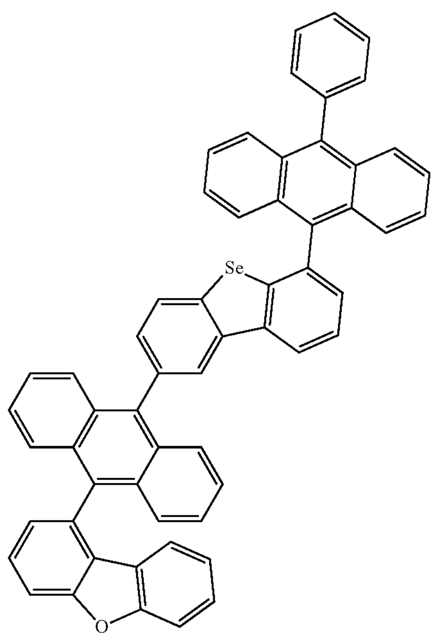
1768
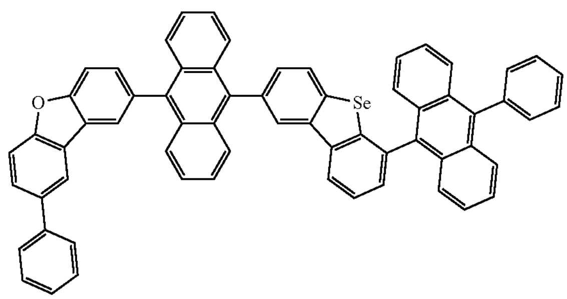
-continued
1769
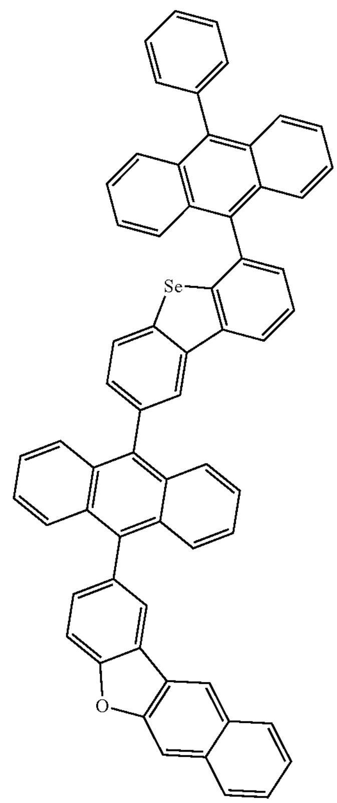
1770
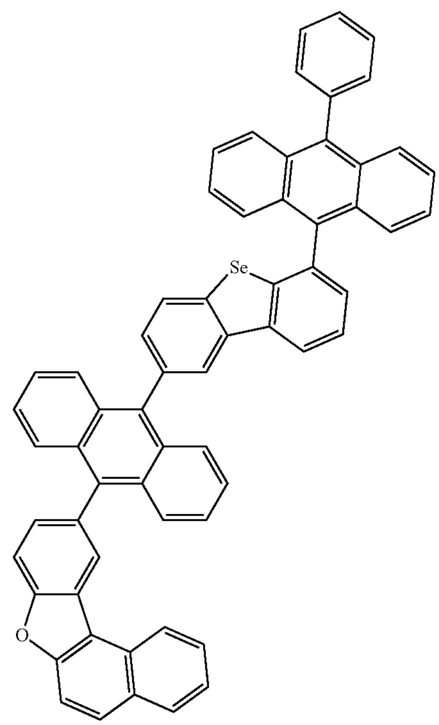

-continued
1771
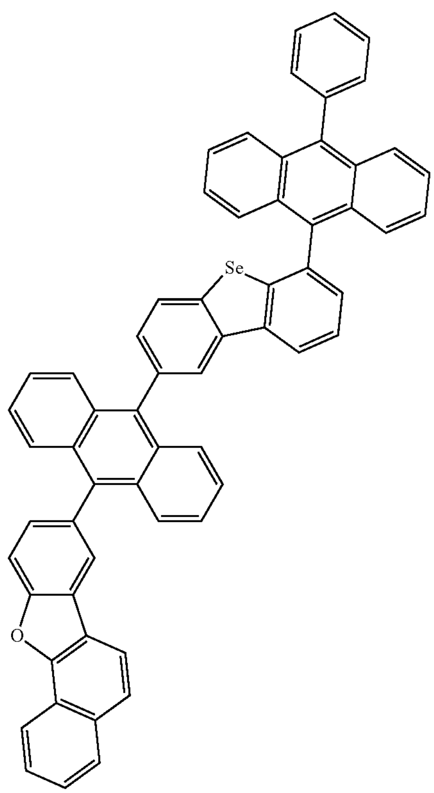
1772
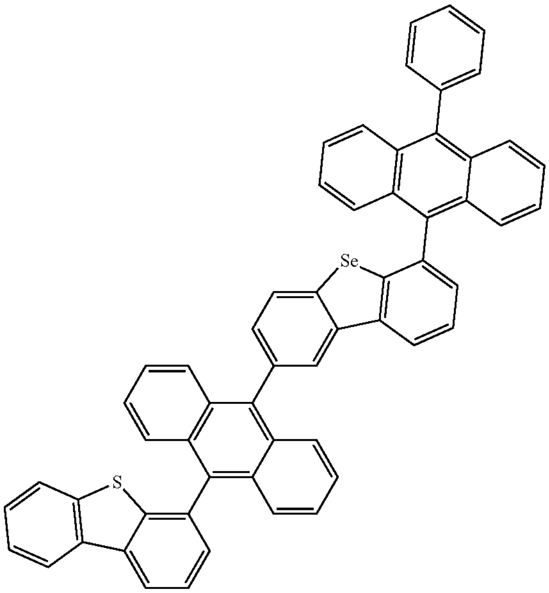
-continued
1773
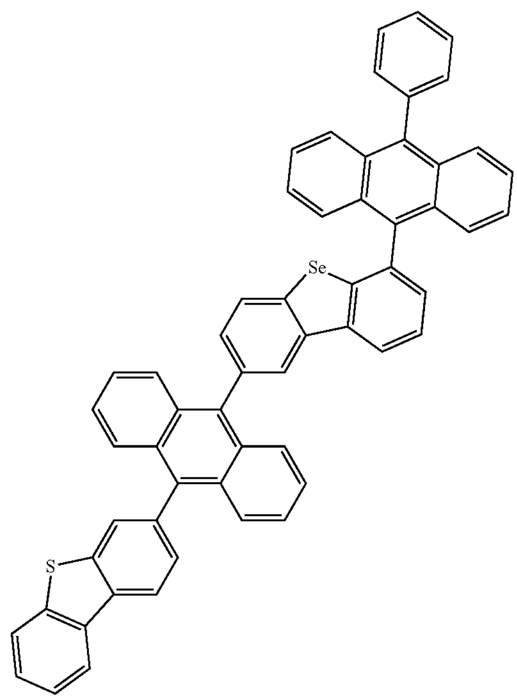
1774
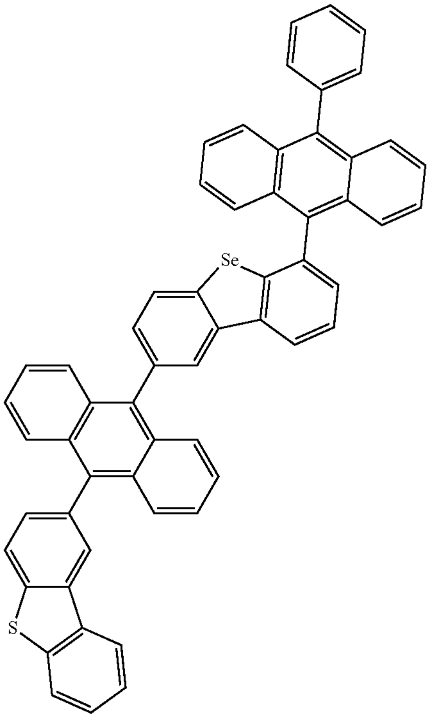

-continued
1775
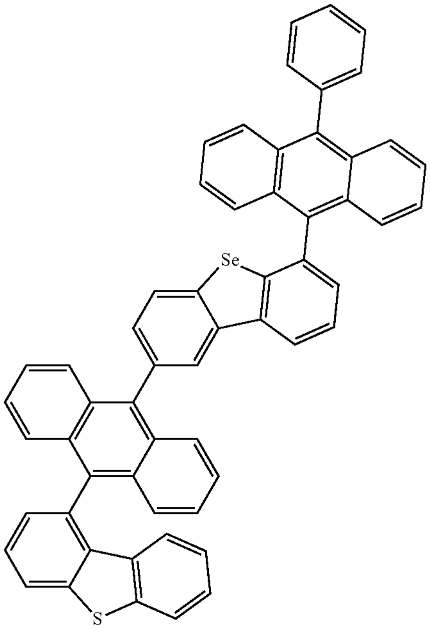
1176
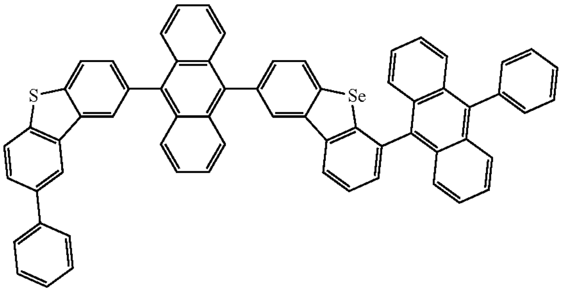
1777
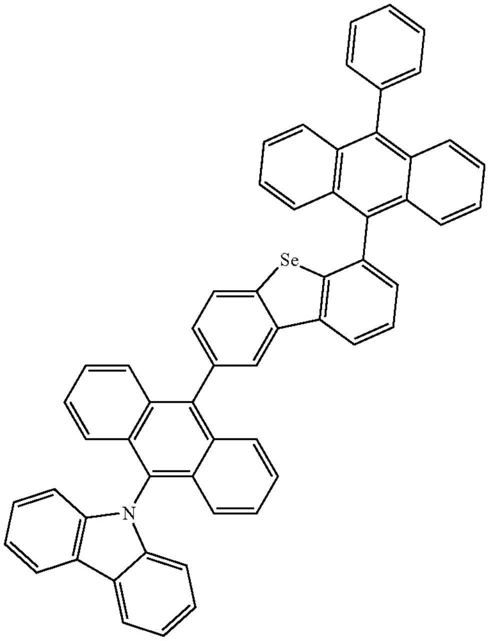
-continued
1778
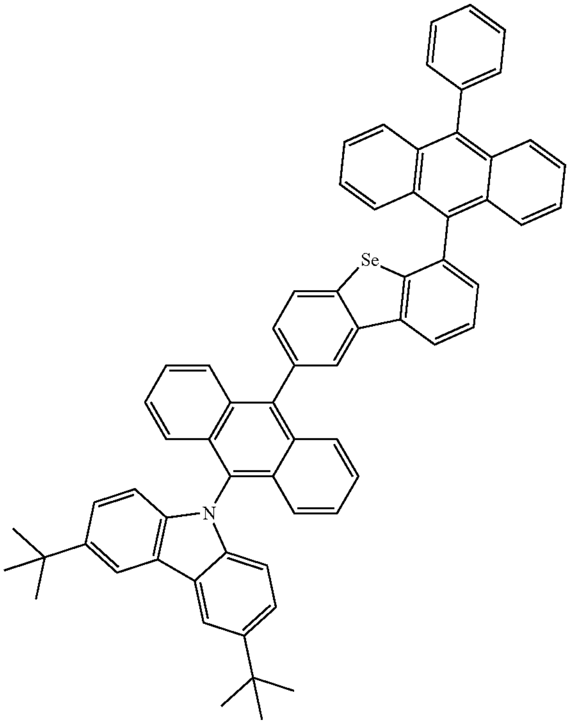
1779
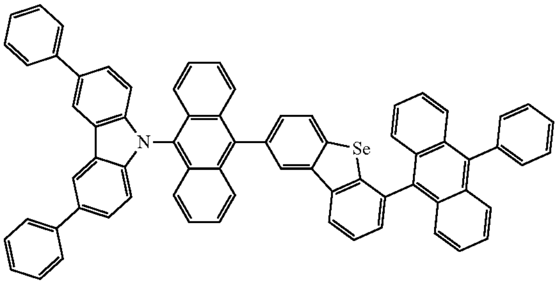
1780
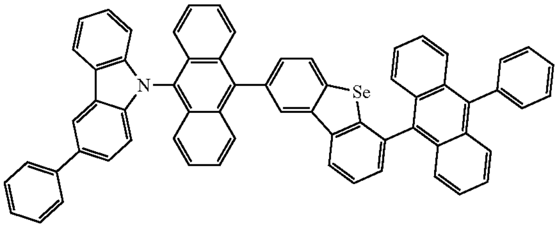
1781
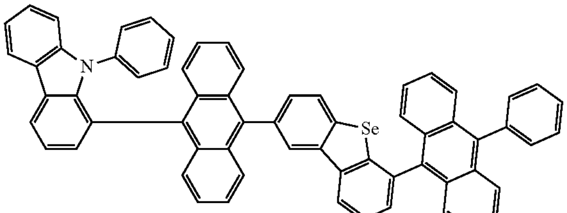

-continued
1782
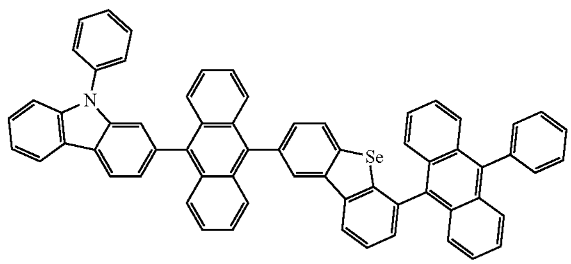
1783
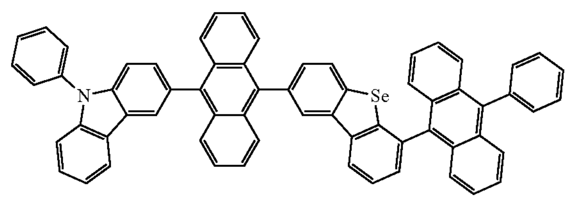
1784
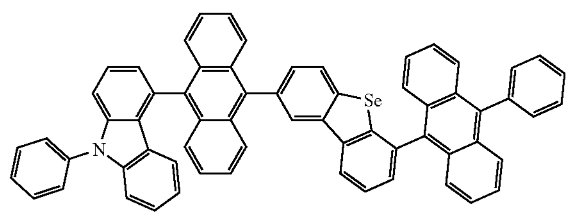
1785
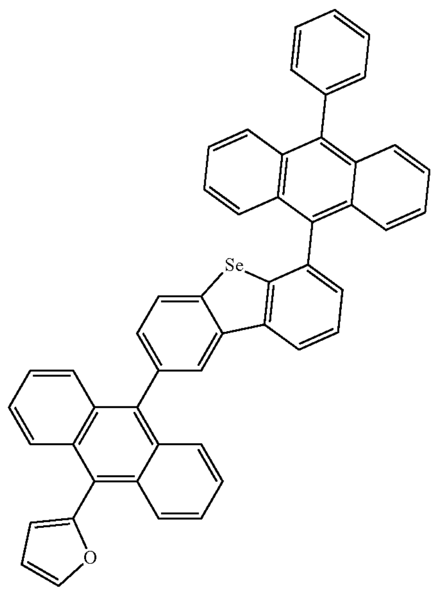
-continued
1786
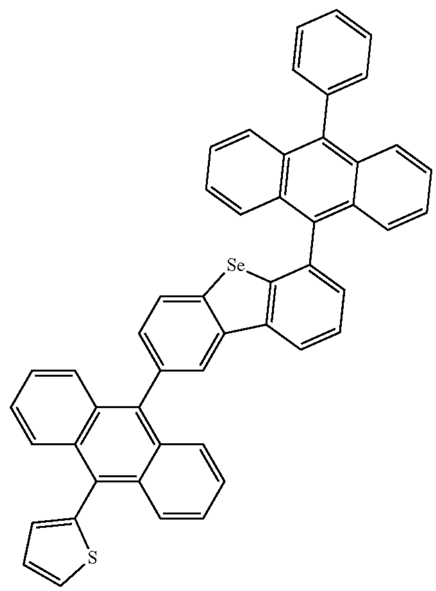
1787
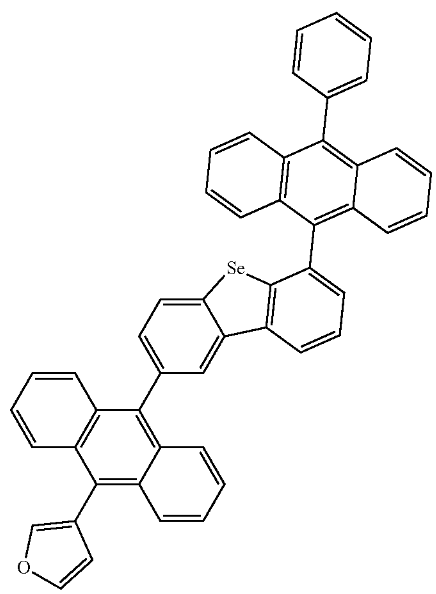

-continued
1788
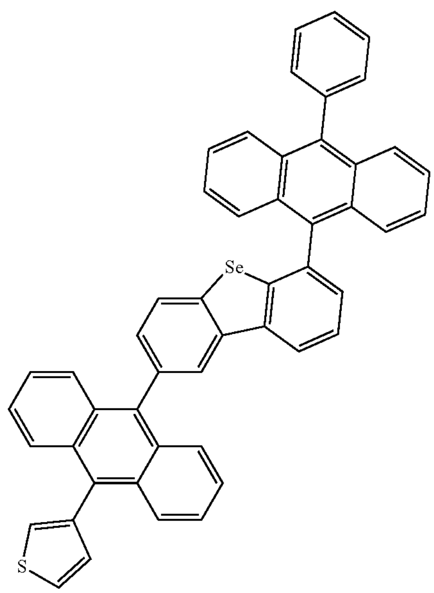
1789
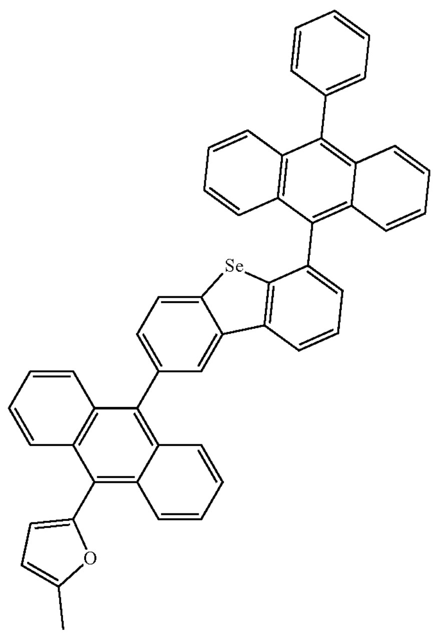
-continued
1790
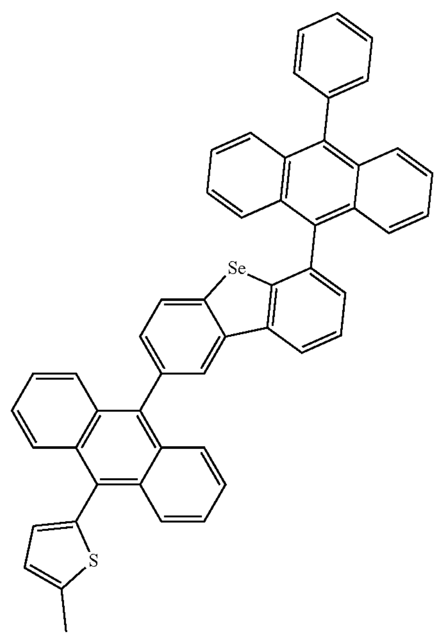
1791
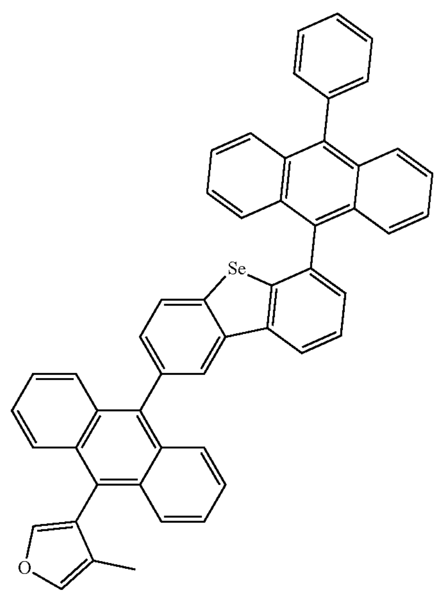

-continued
1792
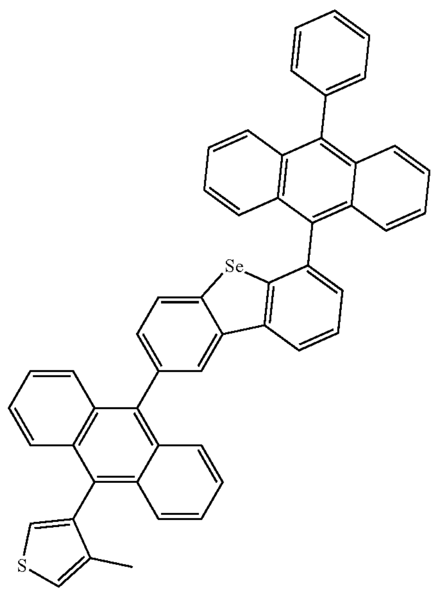
1793
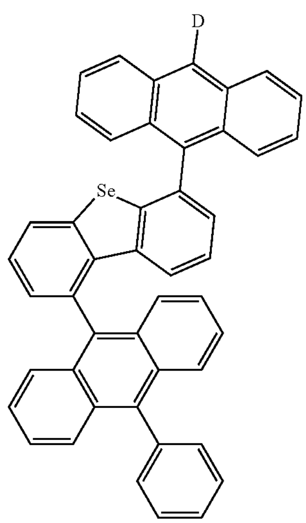
-continued
1794
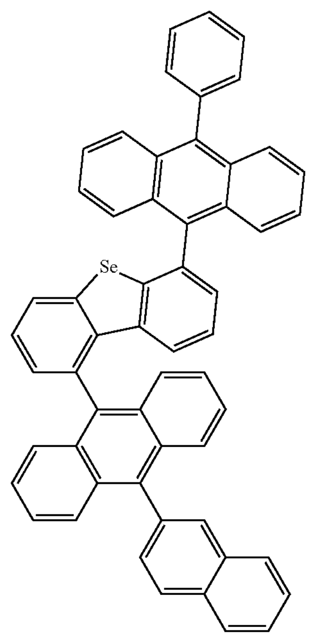
1495
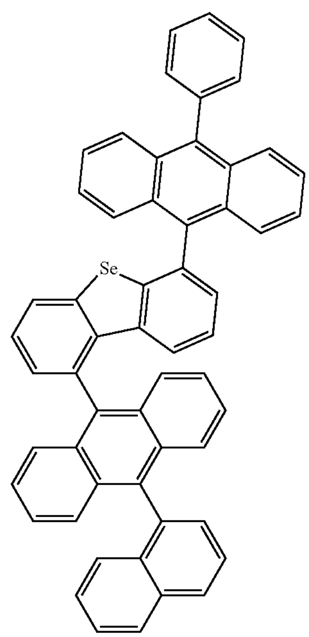

-continued
1796
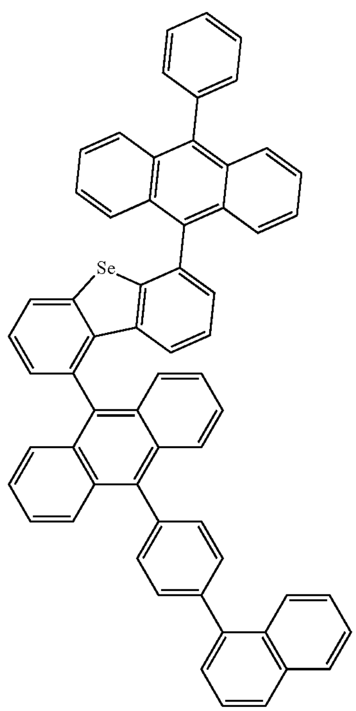
1797
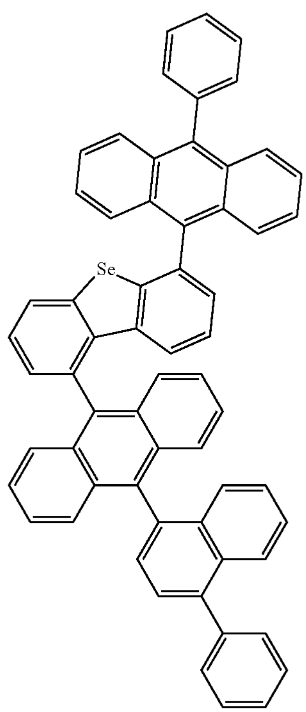
-continued
1798
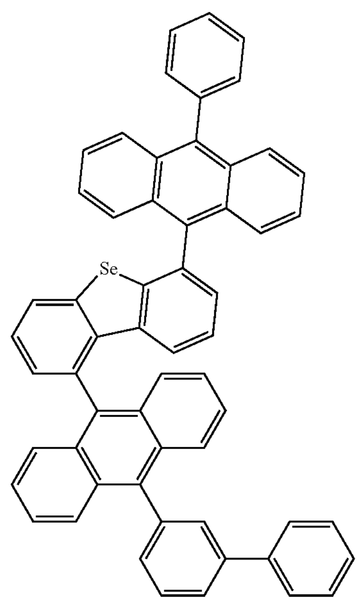
1799
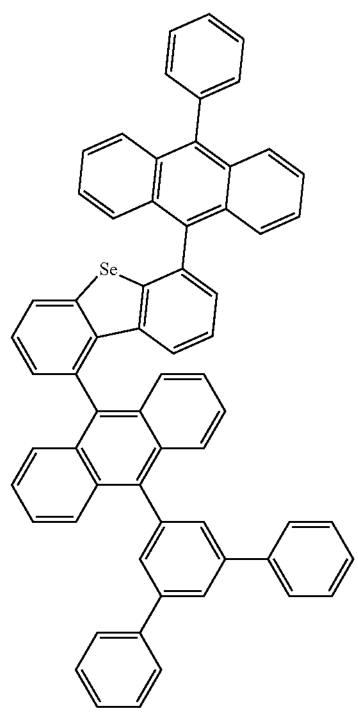

1800
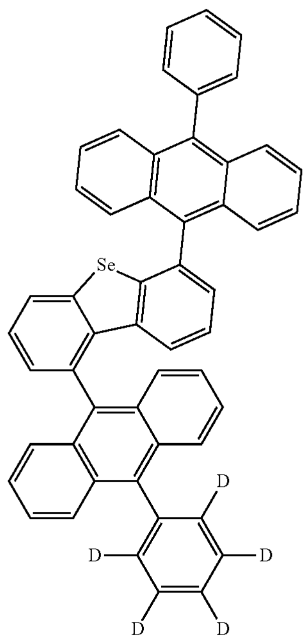
1801
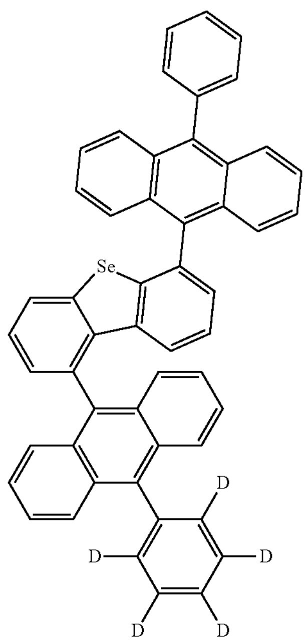
1802
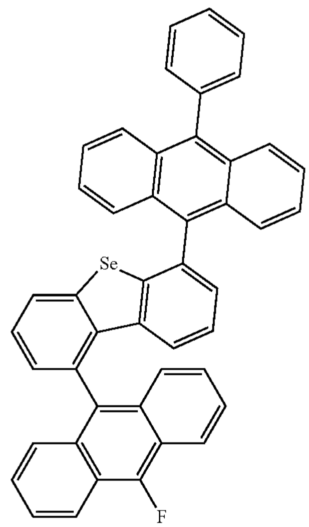
1803
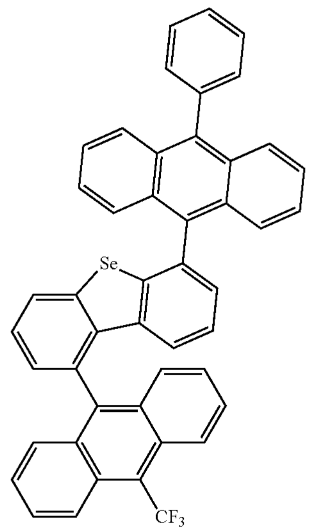
1804
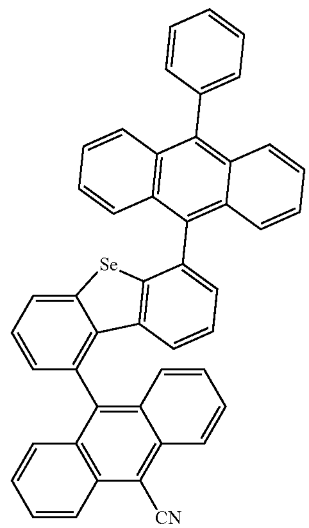

-continued
1805
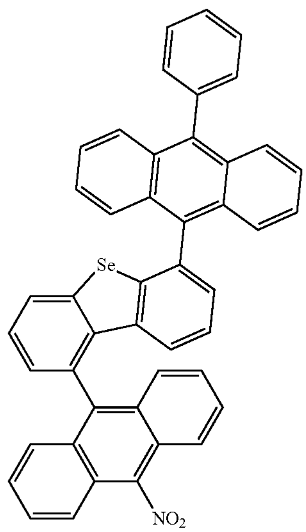
1806
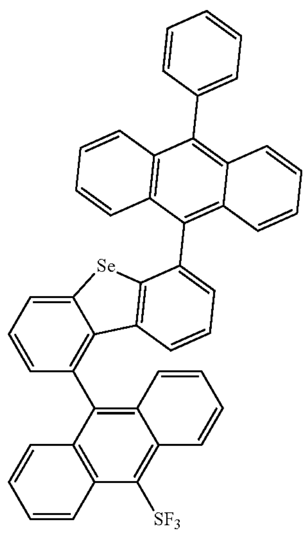
1807
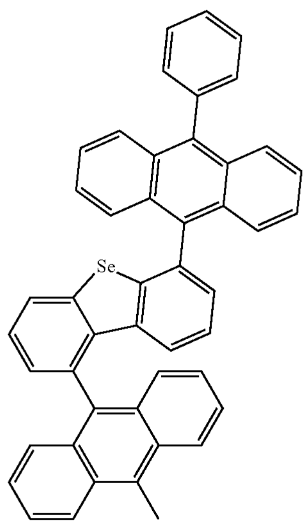
-continued
1808
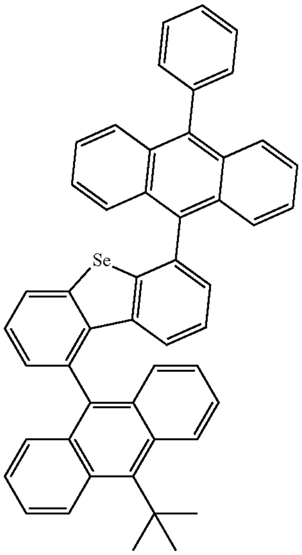
1809
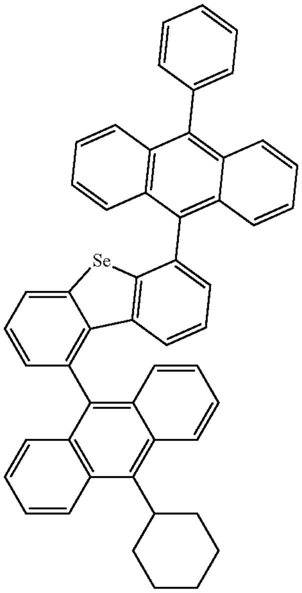
1810
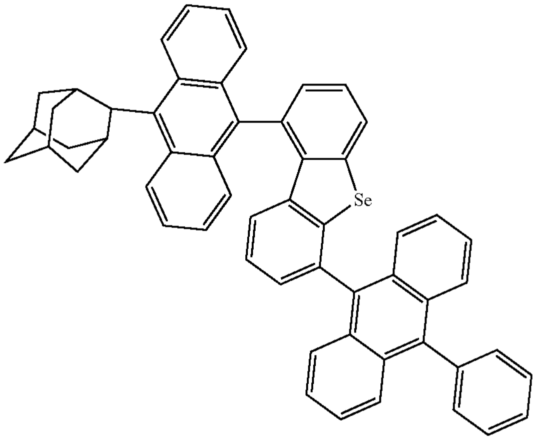

-continued
1811
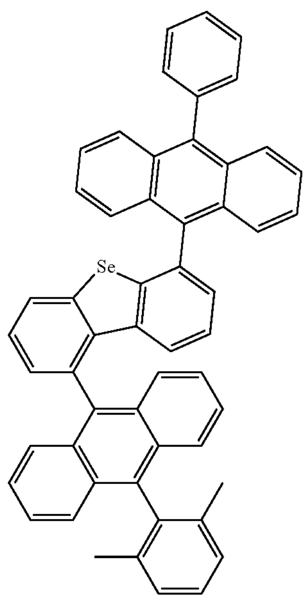
1812
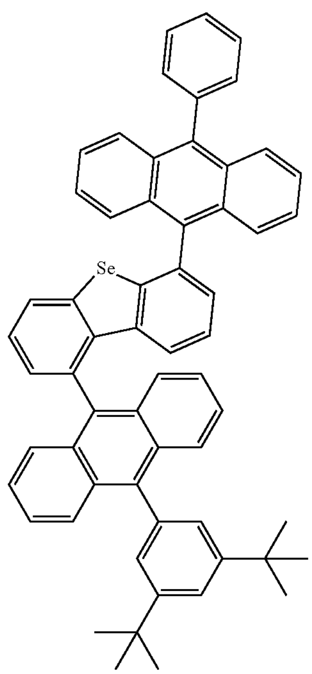
-continued
1813
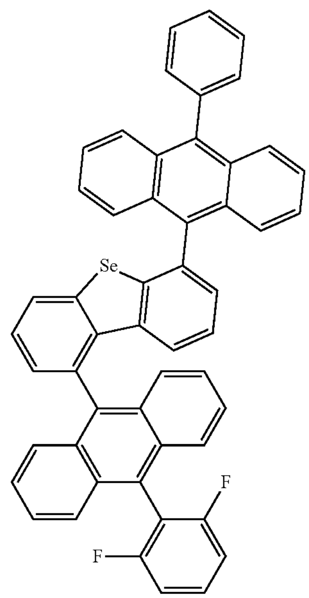
1814
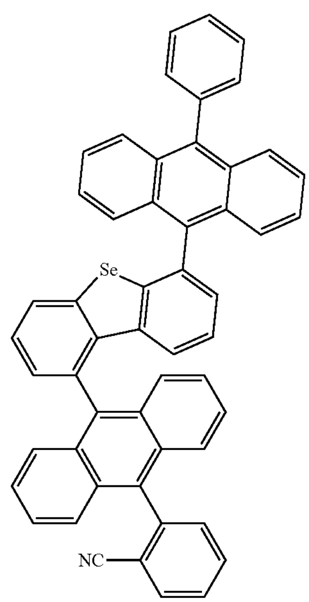

-continued
1815
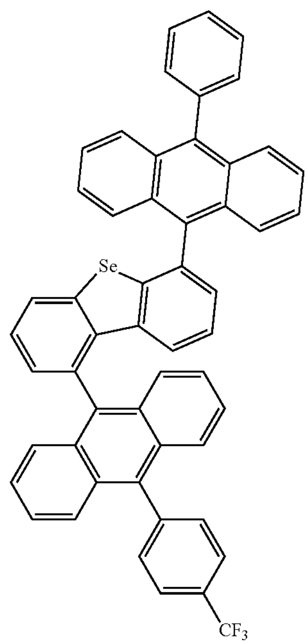
1816
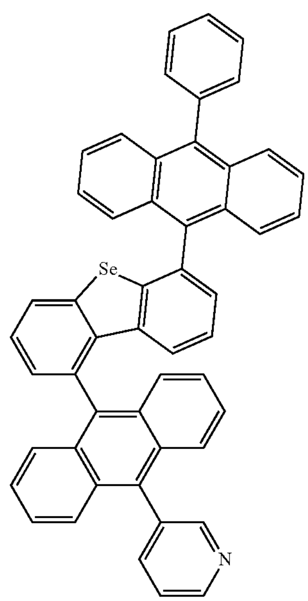
-continued
1817
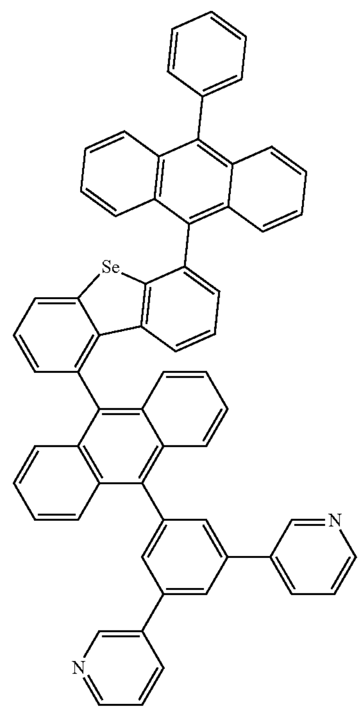
1818
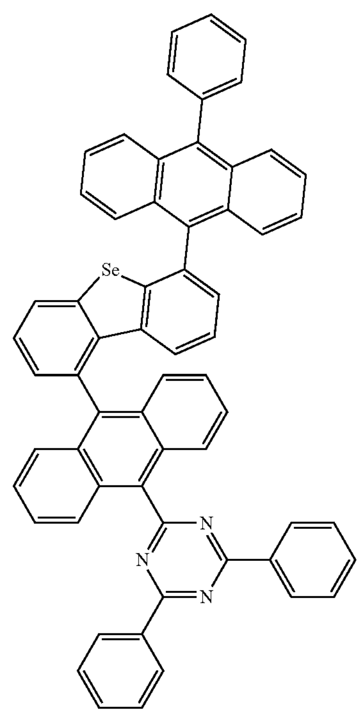

-continued
1819
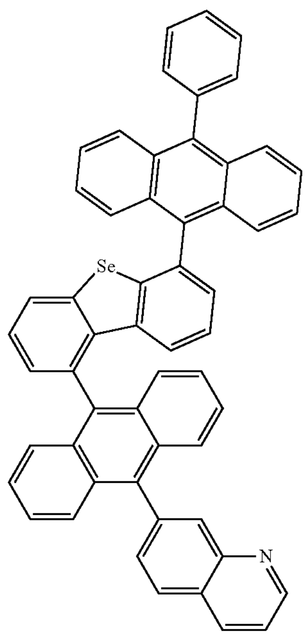
1820
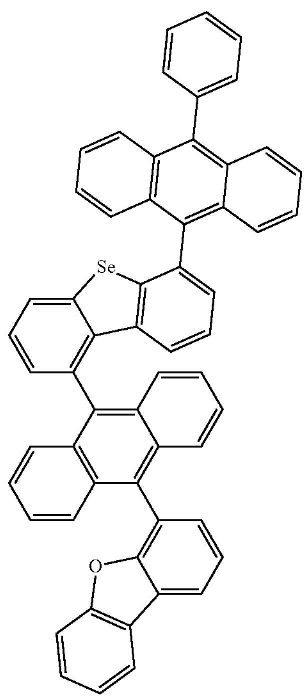
-continued
1821
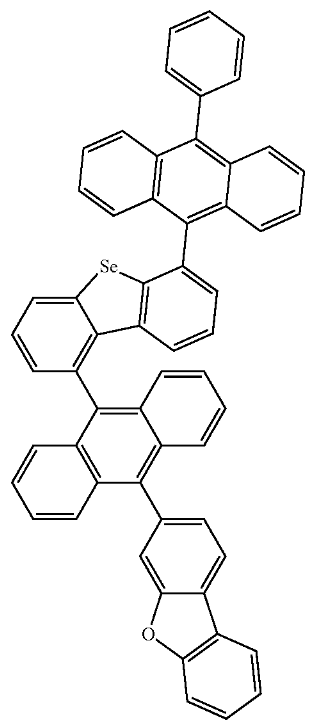
1822
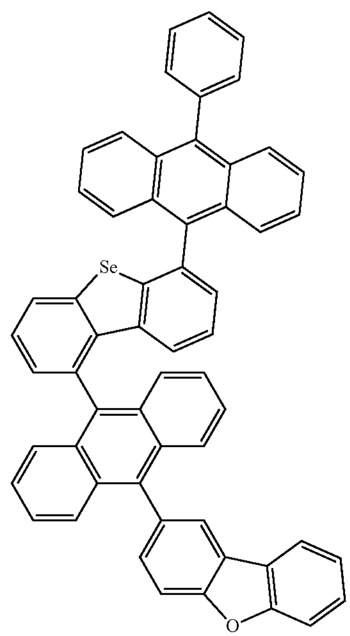

-continued
1823
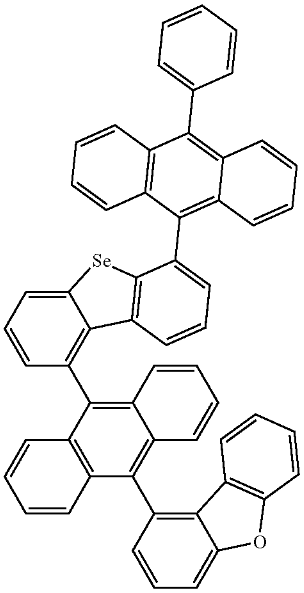
1824
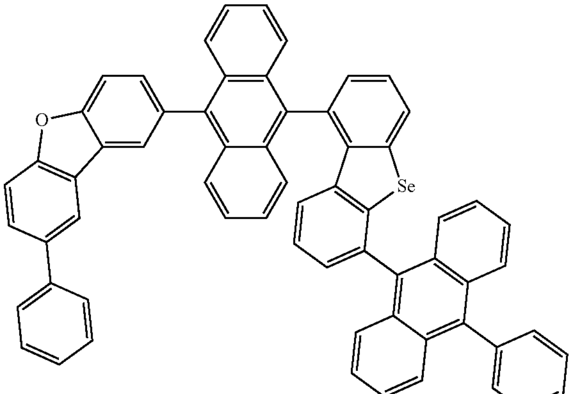
1825
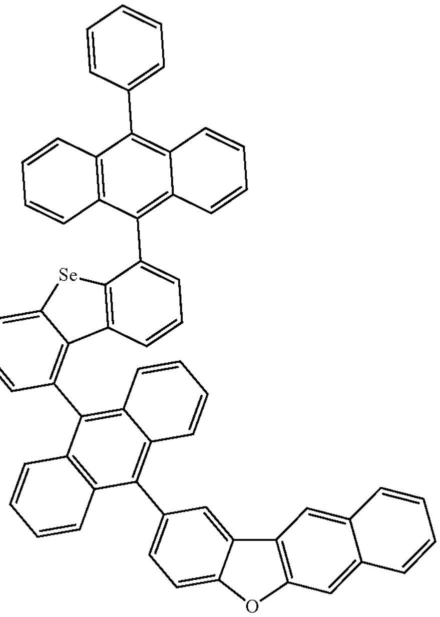
-continued
1826
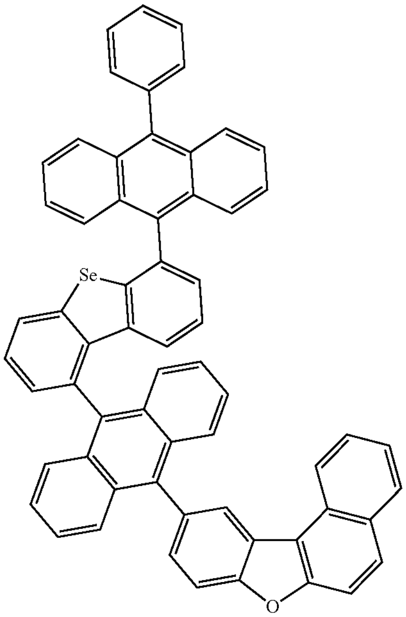
1827
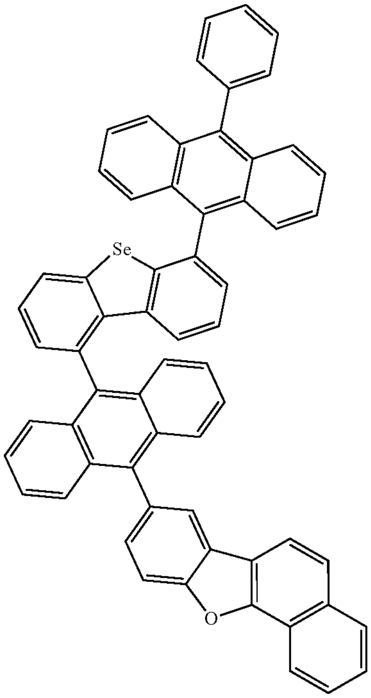

-continued
1828
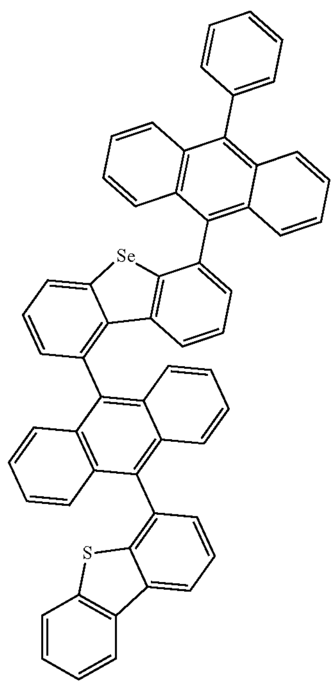
1829
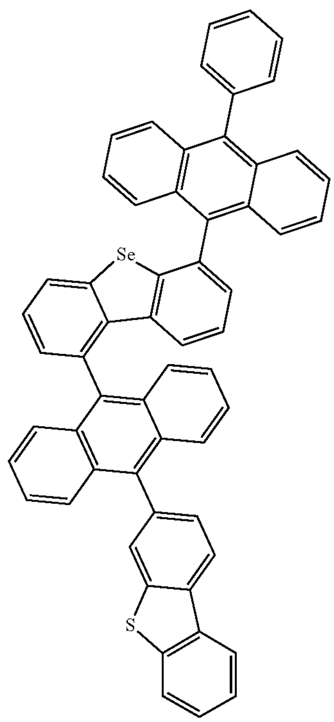
-continued
1830
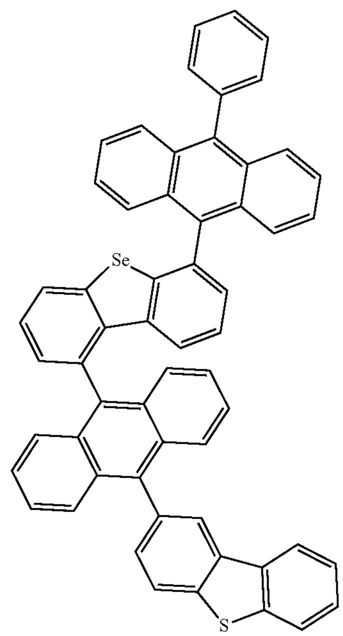
1831
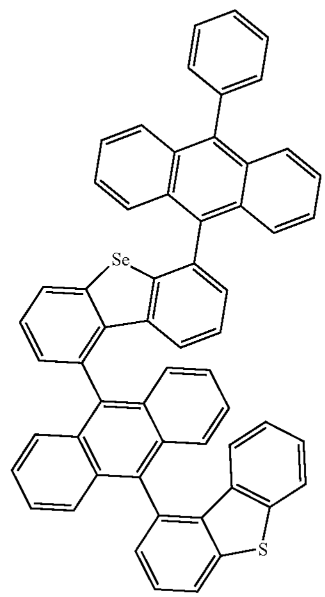
1832
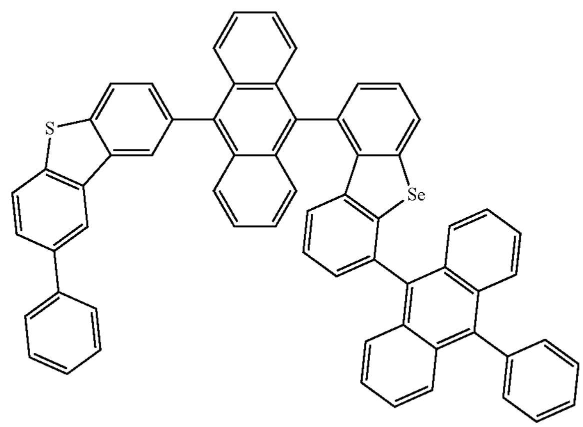

-continued
1833
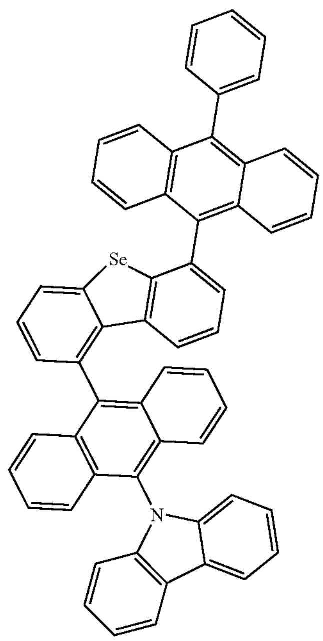
1834
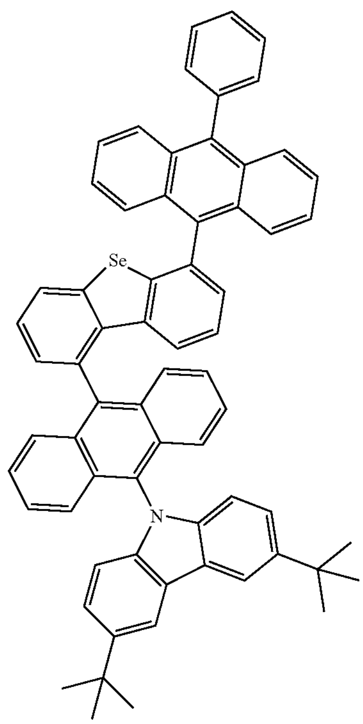
-continued
1835
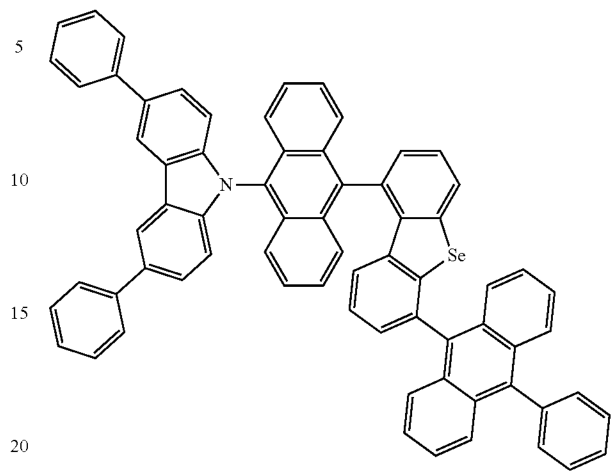
1836
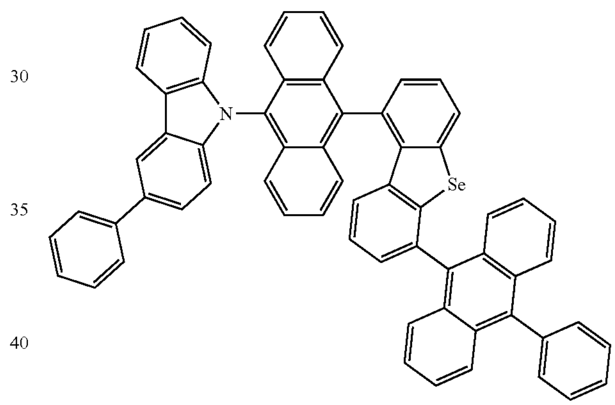
1837
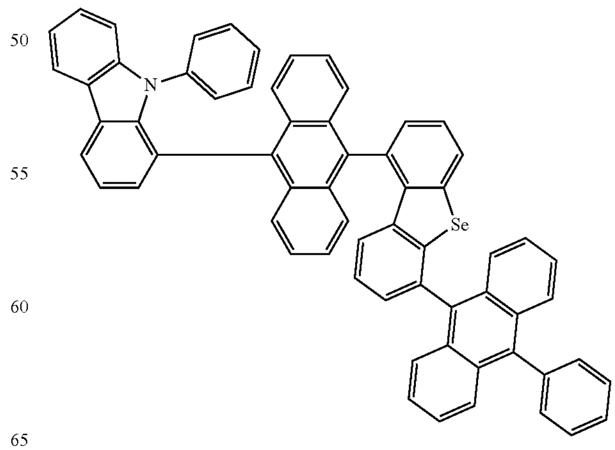

-continued
1838
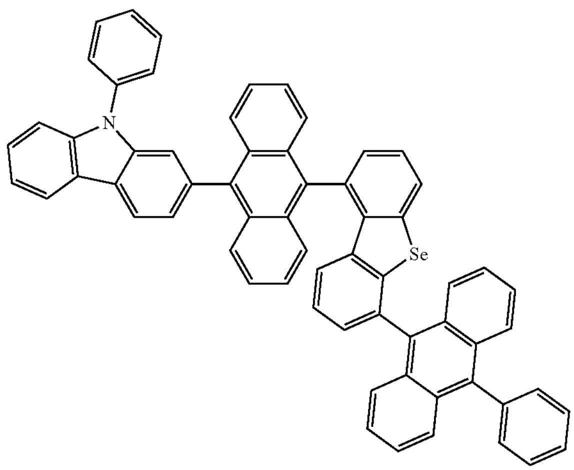
1839
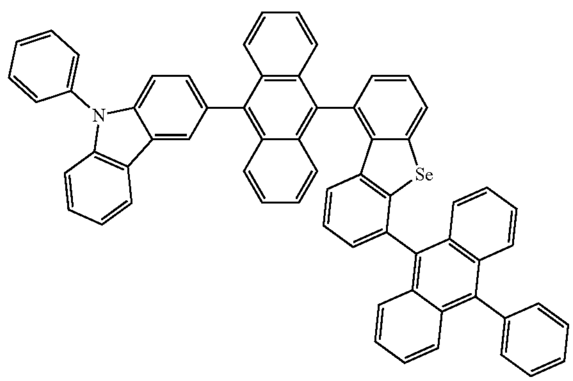
1840
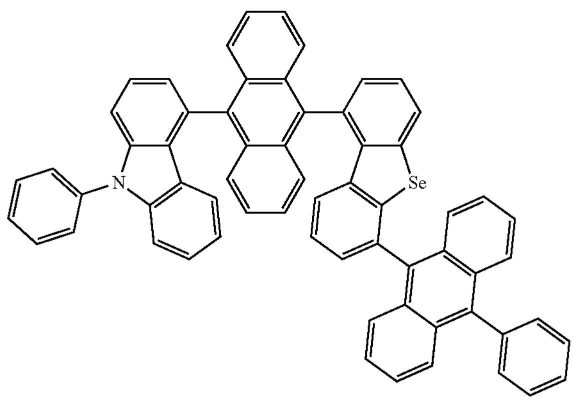
-continued
1841
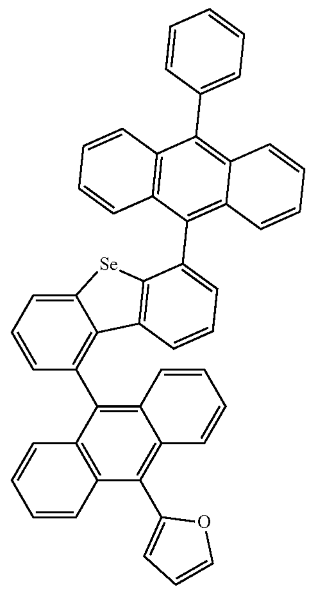
1842
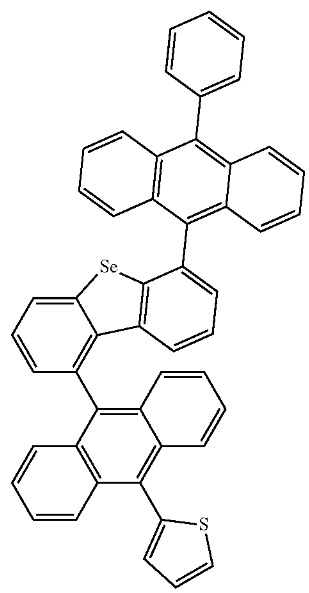

-continued
1843
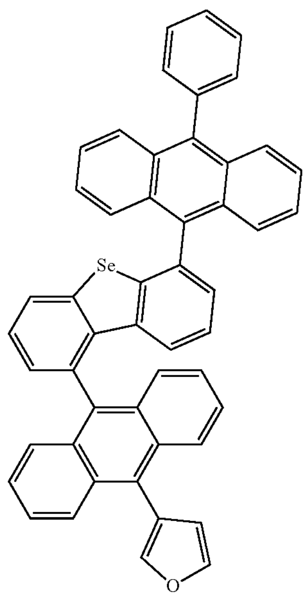
1844
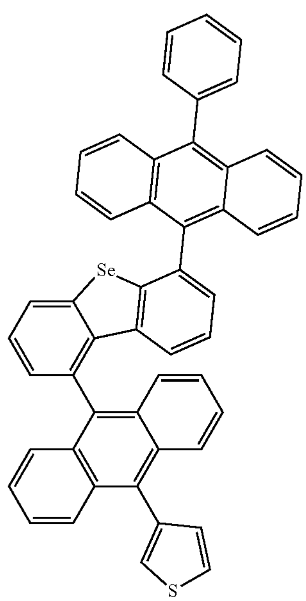
-continued
1845
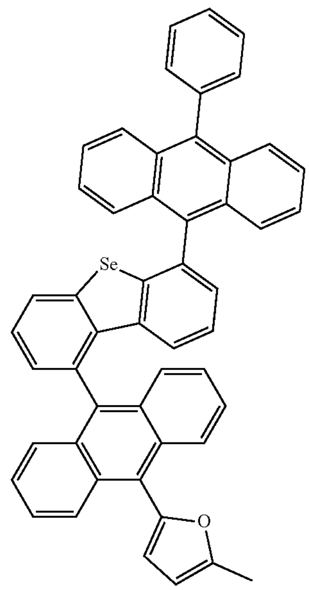
1846
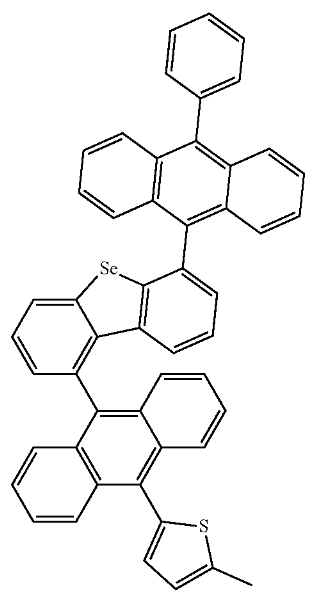

-continued
1847
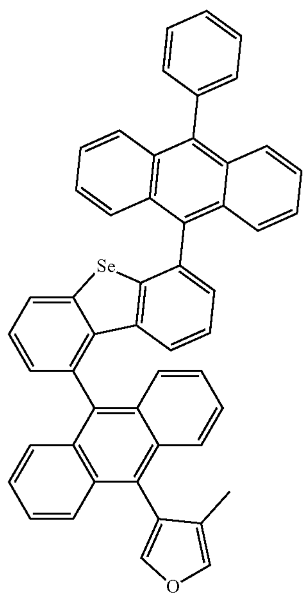
1848
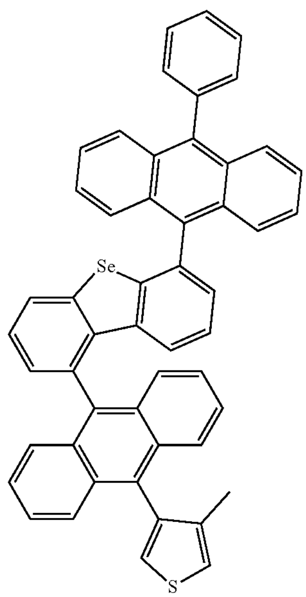
1849
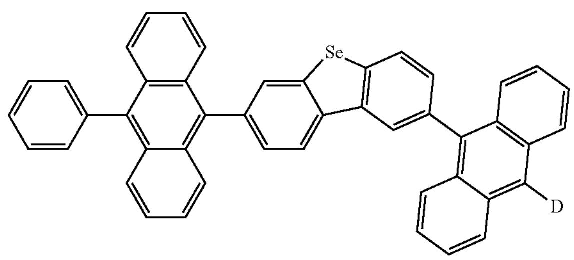
-continued
1850
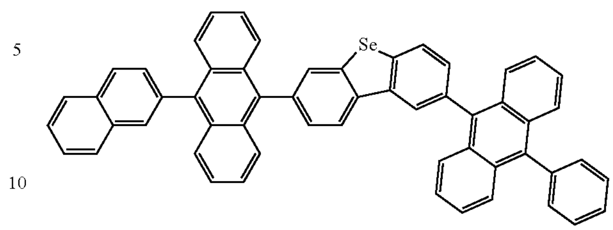
1851
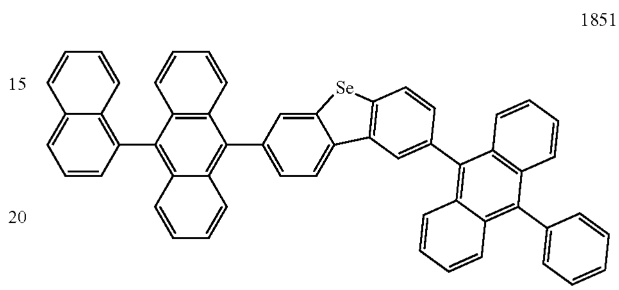
1852
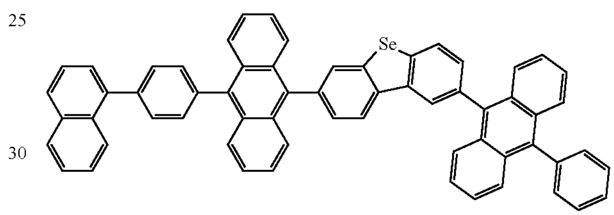
1853
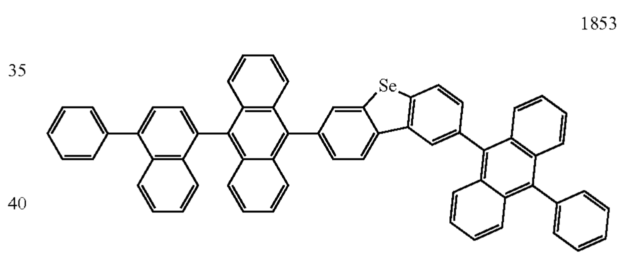
1854
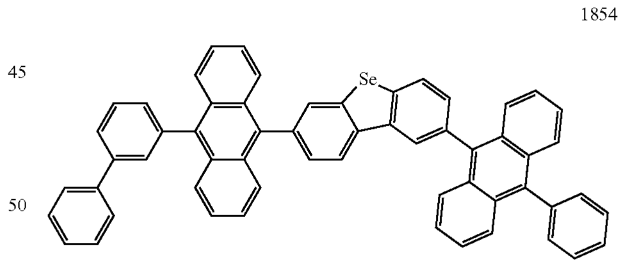
1855
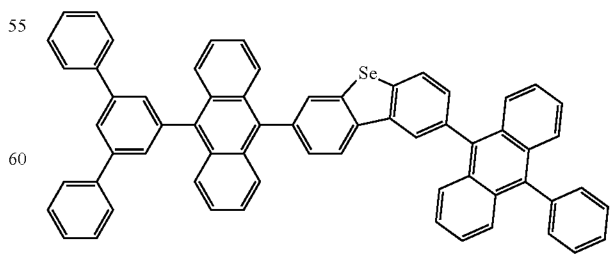

-continued
1856
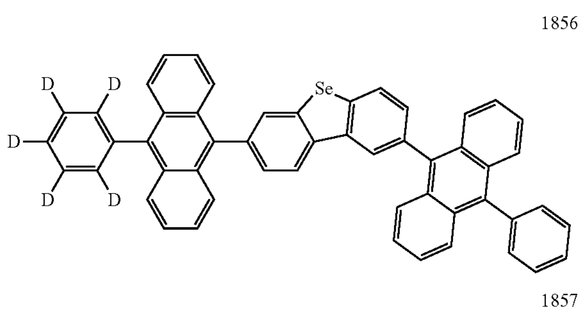
1857
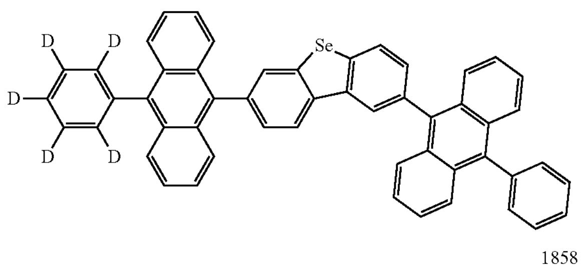
1858
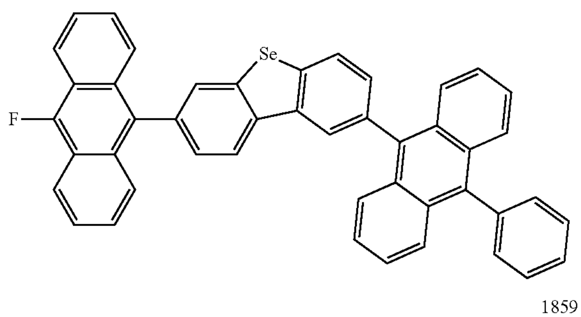
1859
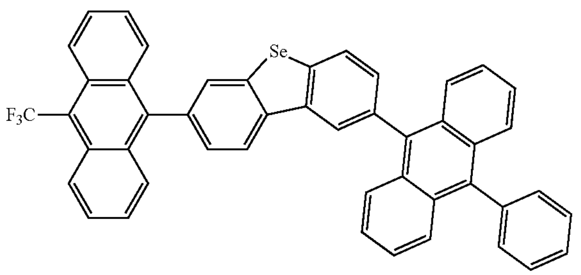
1860
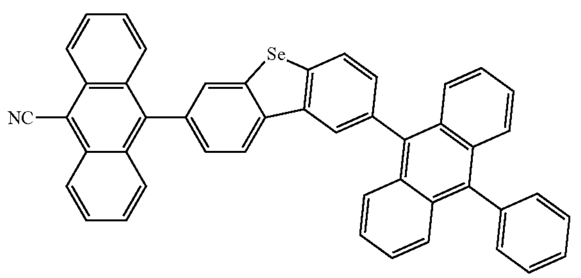
-continued
1861
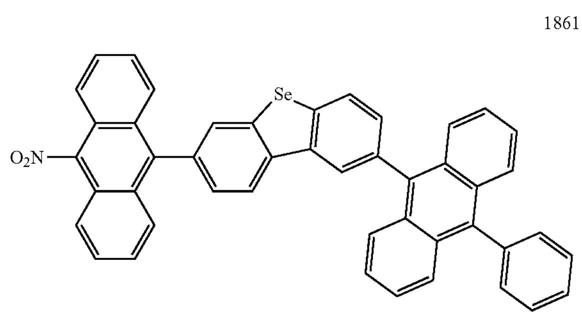
1862
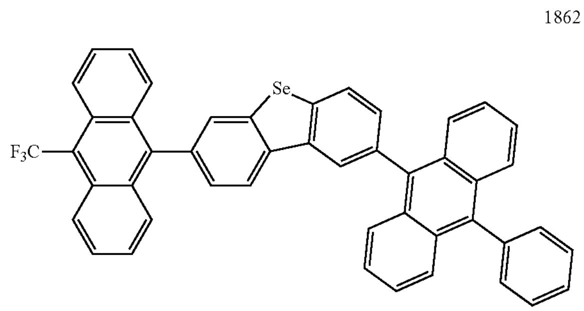
1863
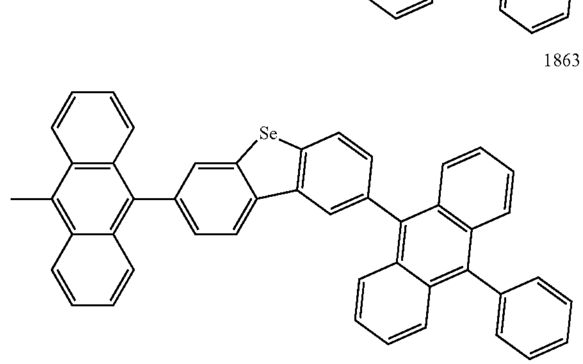
1864
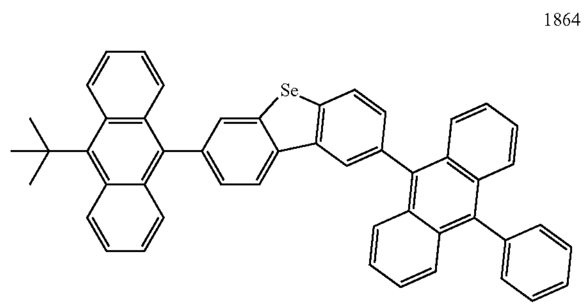
1865
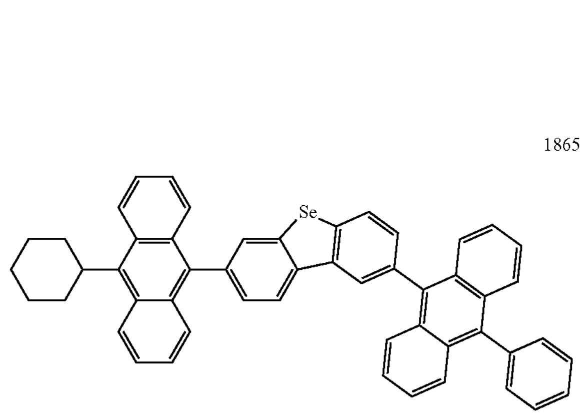

-continued
1866
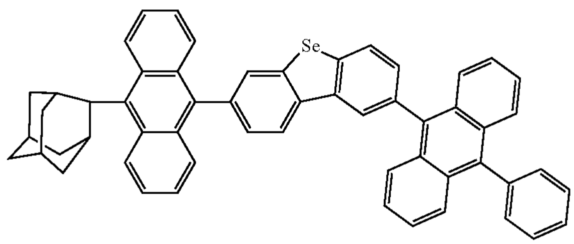
1867
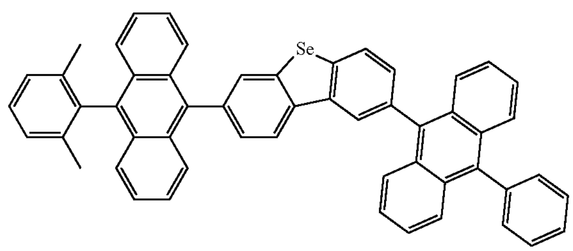
1868
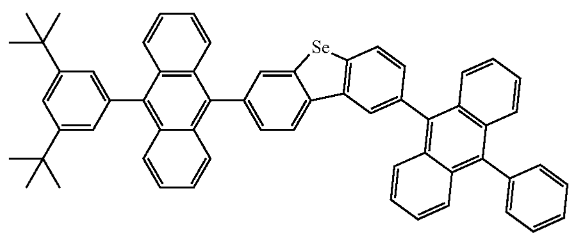
1869
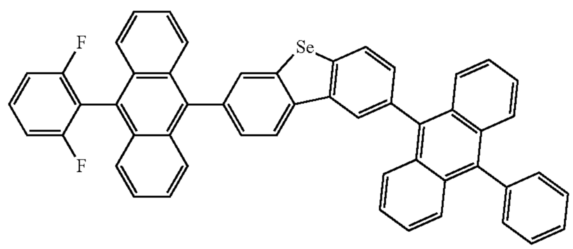
1870
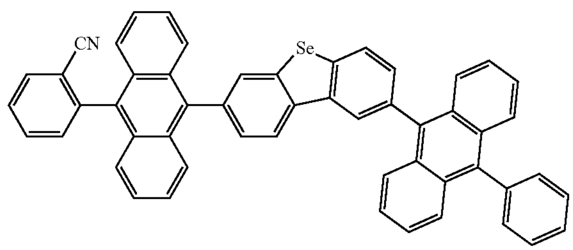
1871
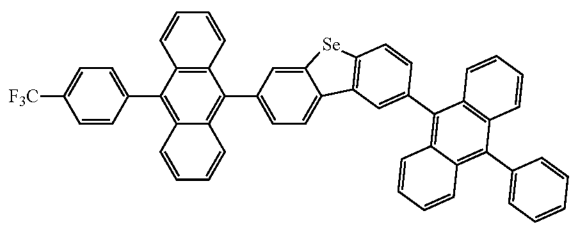
-continued
1872
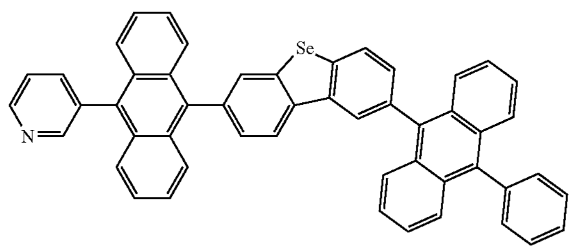
1873
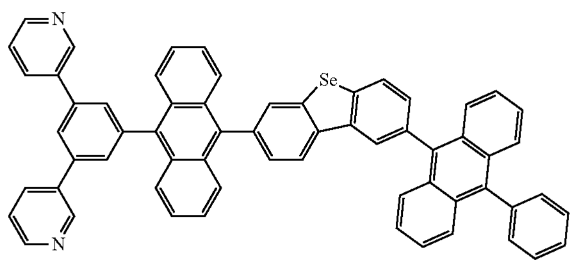
1874
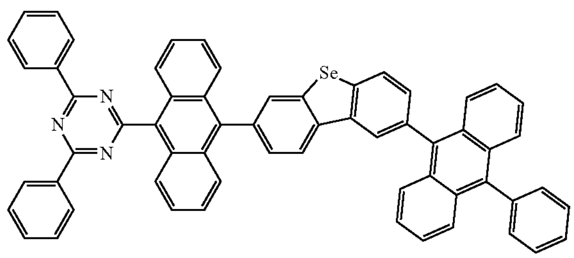
1875
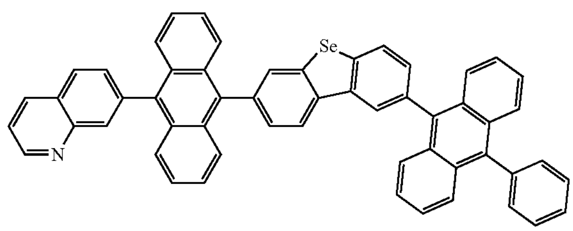
1876
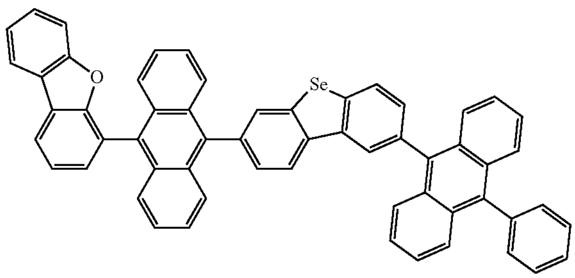
1877
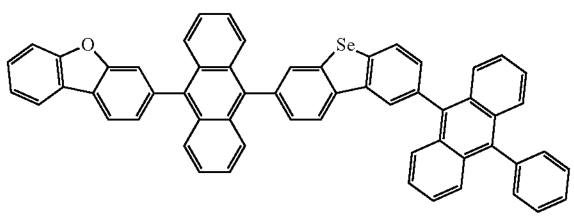

-continued
1878
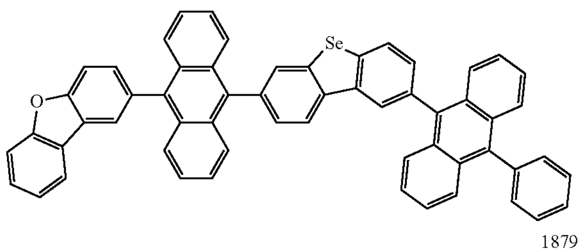
1879
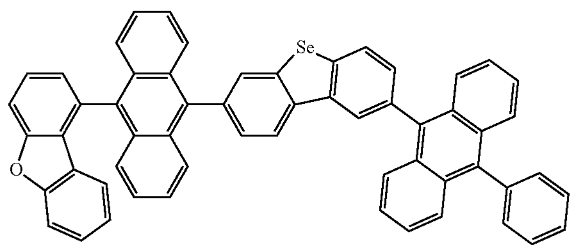
1880
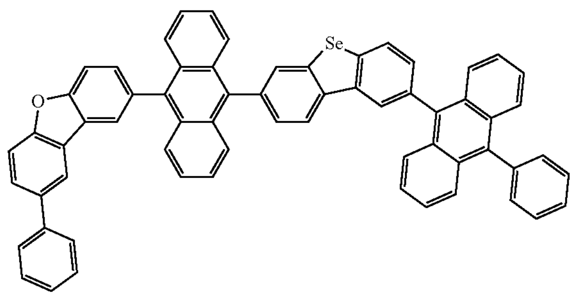
1881
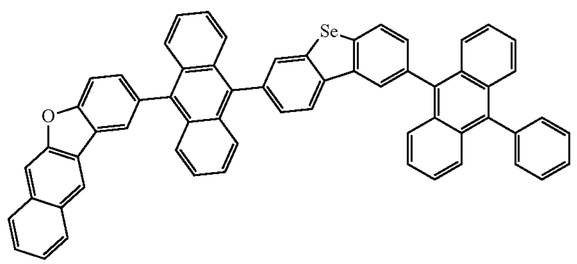
1882
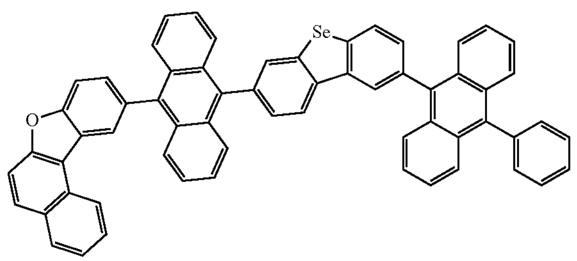
1883
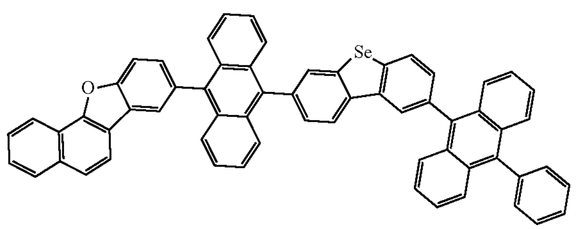
-continued
1884
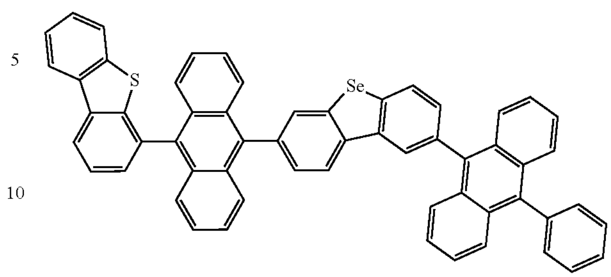
1885
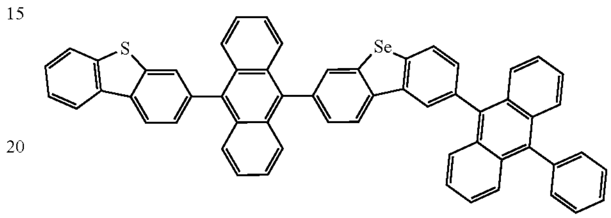
1886
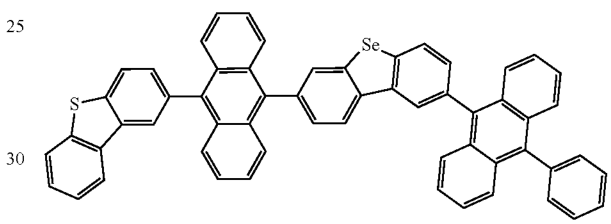
1887
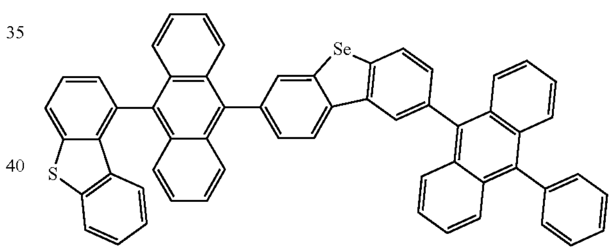
1888
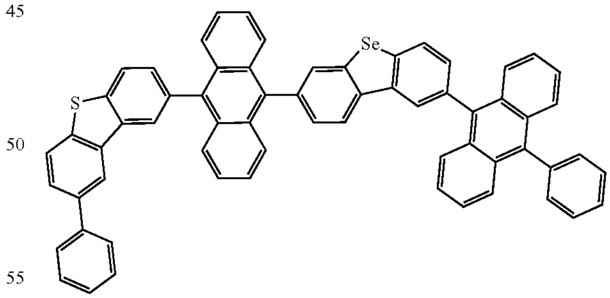
1889
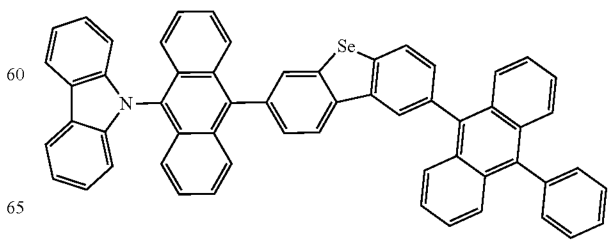

-continued
1890
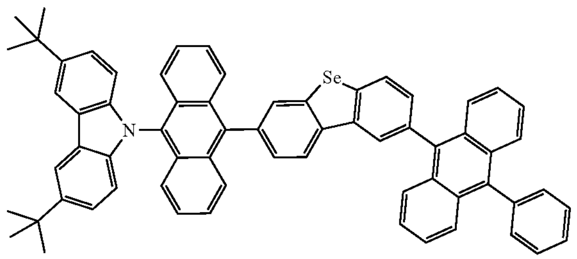
1891
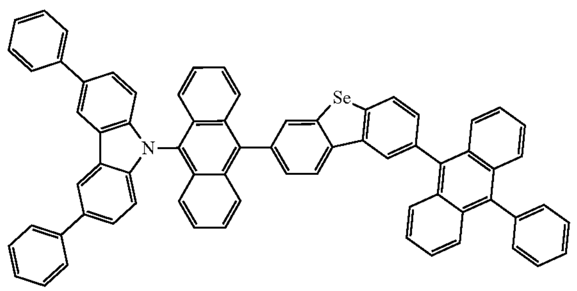
1892
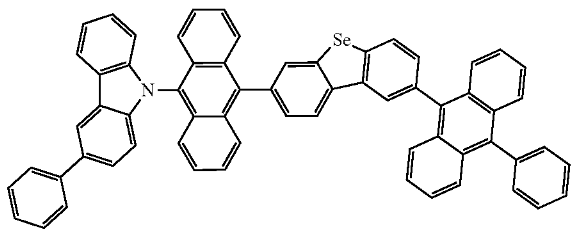
1893
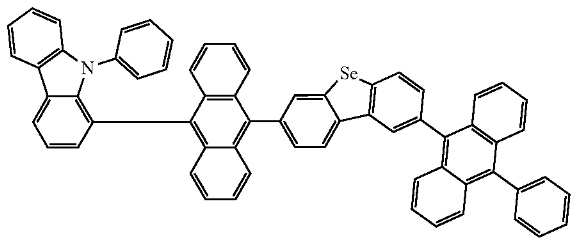
1894
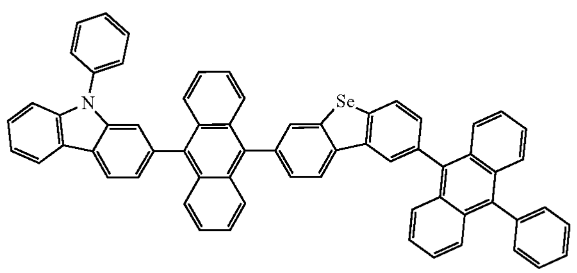
1895
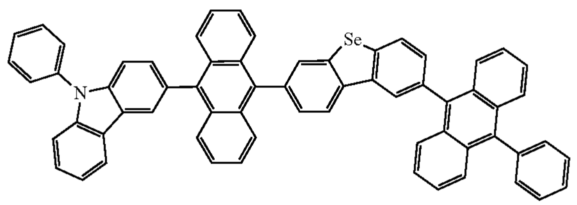
-continued
1896
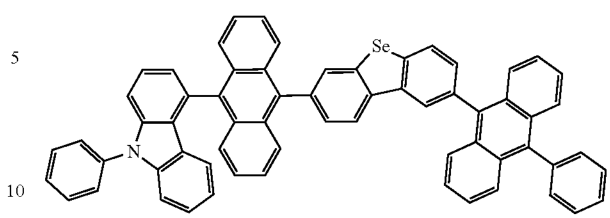
1897
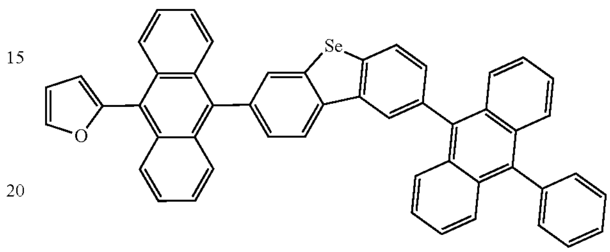
1898
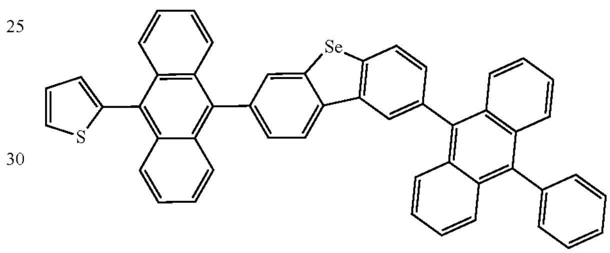
1899
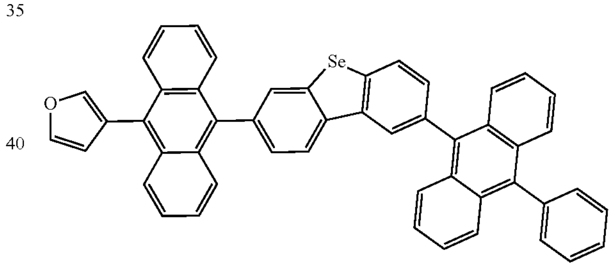
1900
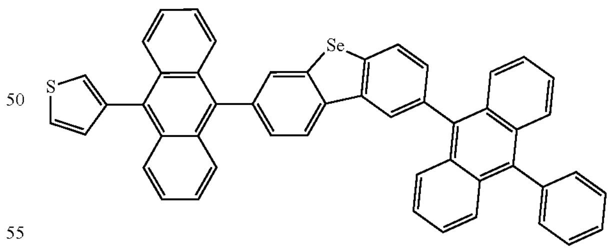
1901
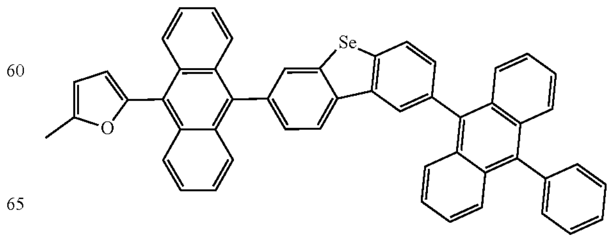

-continued
1902
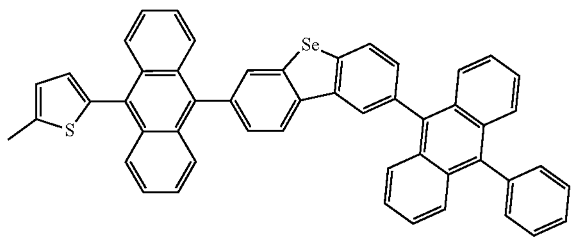
1903
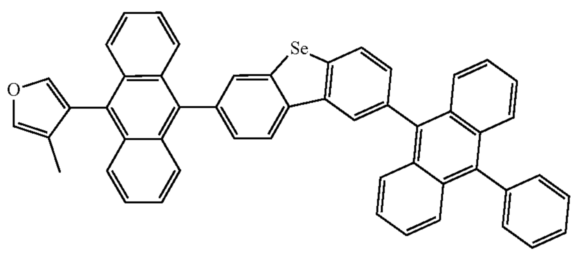
1904
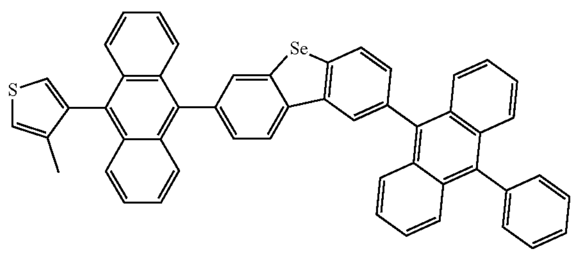
1905
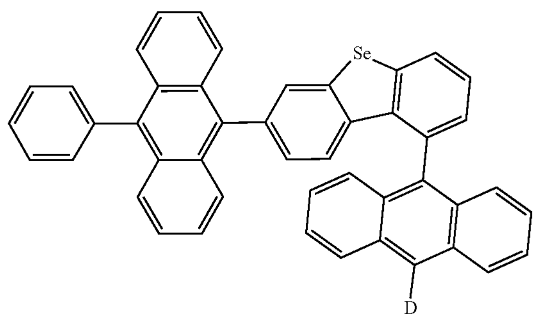
1906
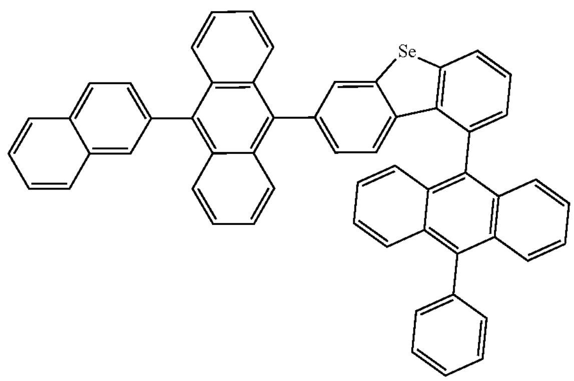
-continued
1907
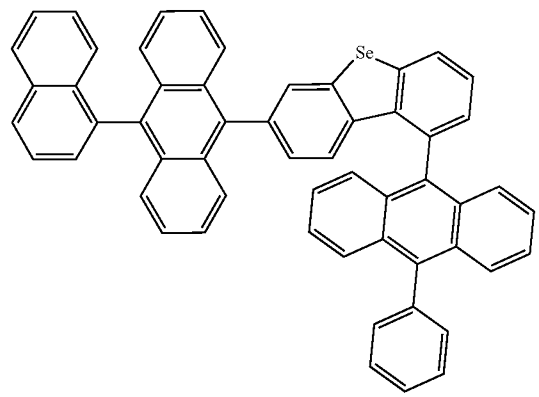
1908
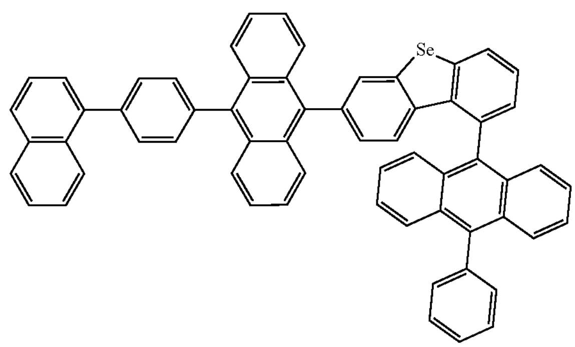
1909
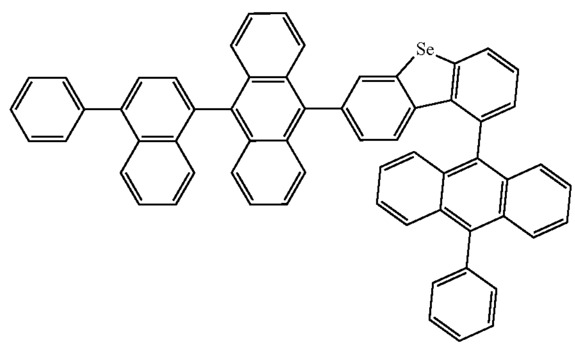
1910
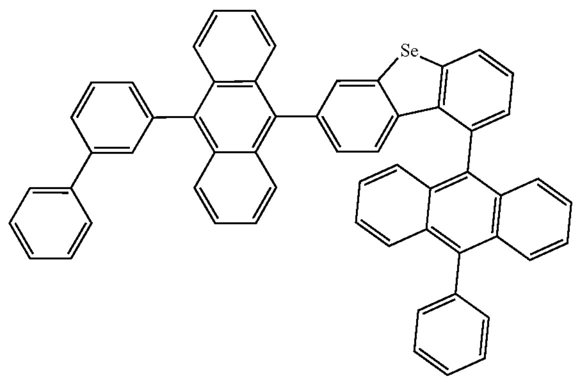

-continued
1911
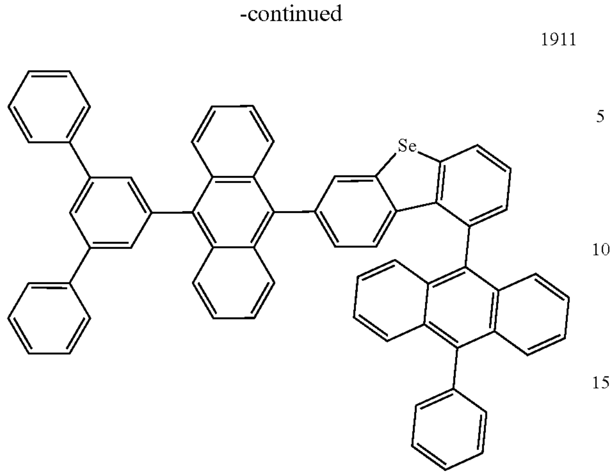
1912
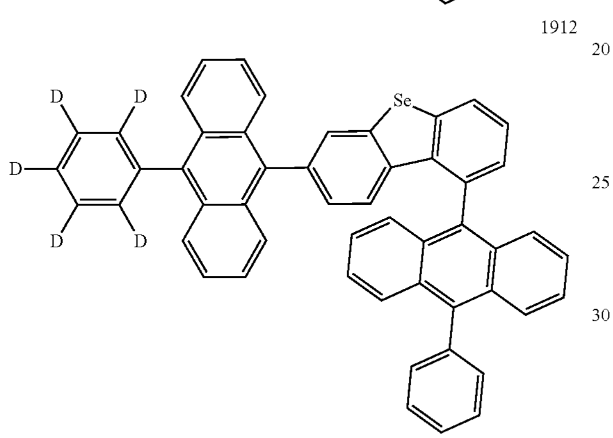
1913
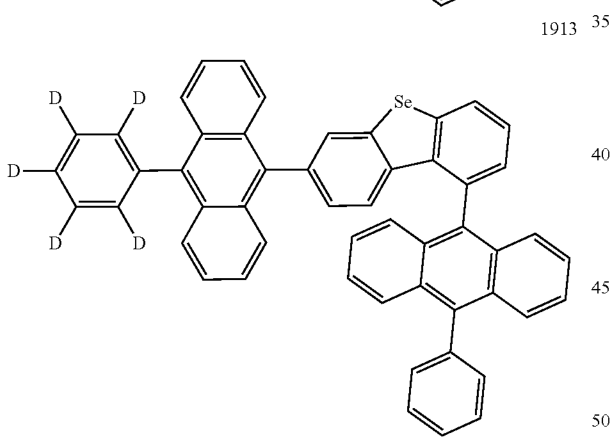
1914
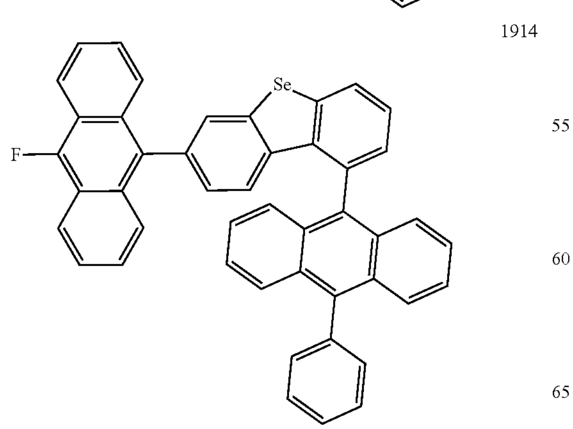
-continued
1915
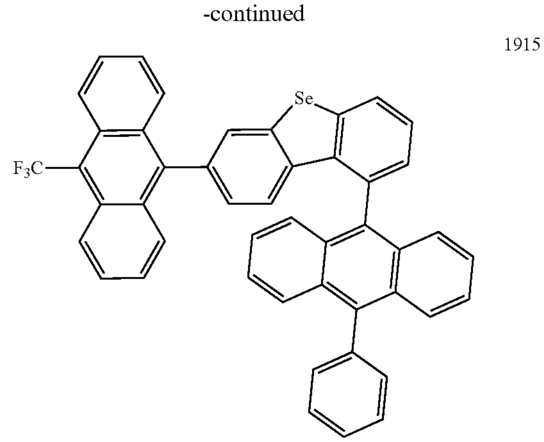
1916
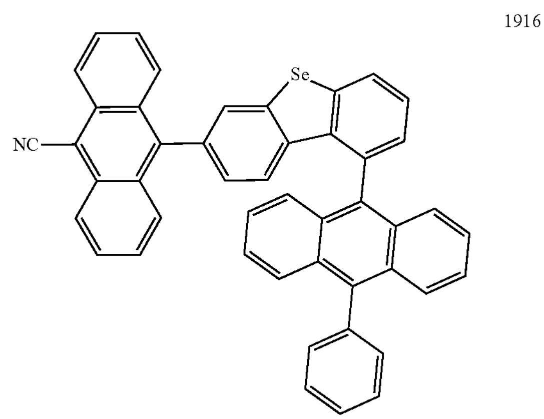
1917
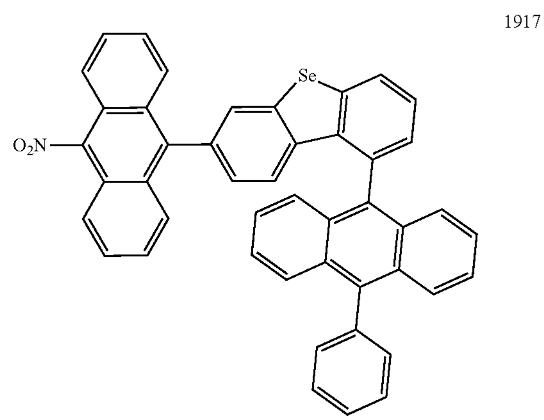
1918
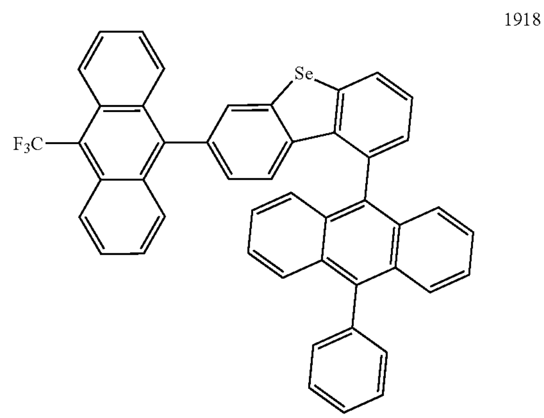

-continued
1919
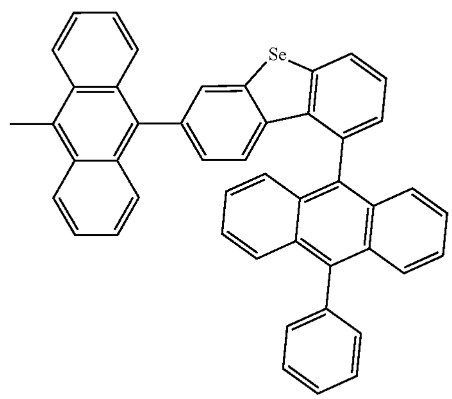
1920
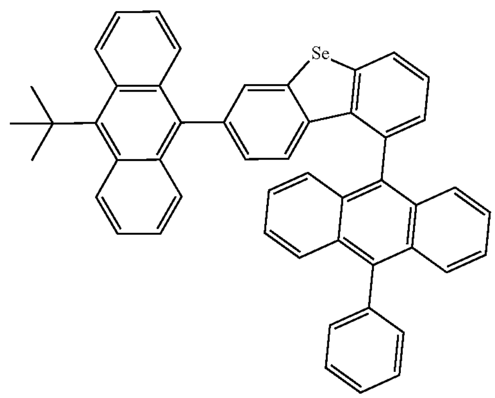
1921
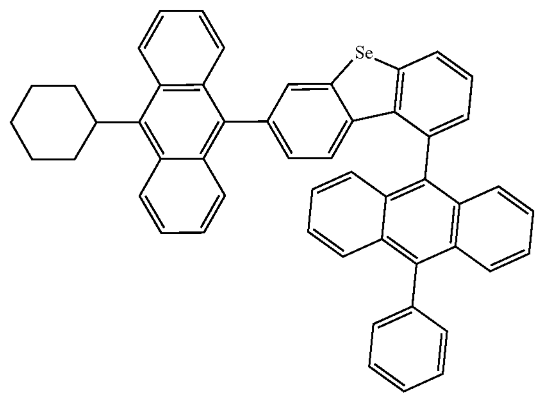
1922
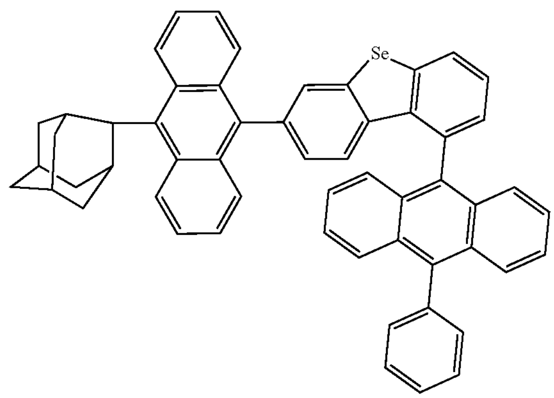
-continued
1923
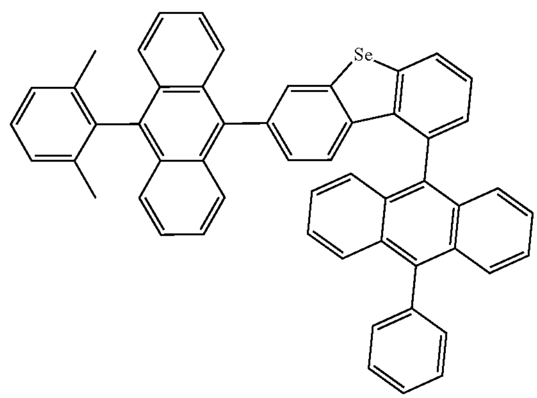
1924
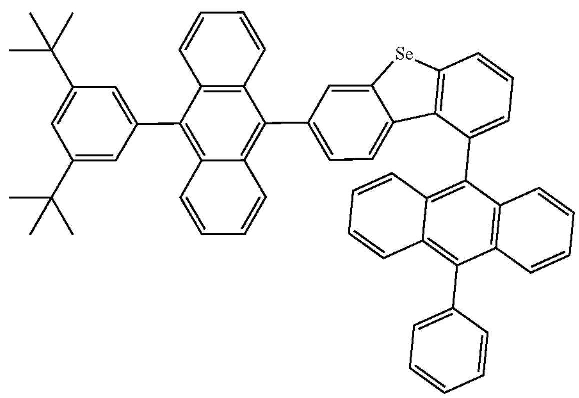
1925
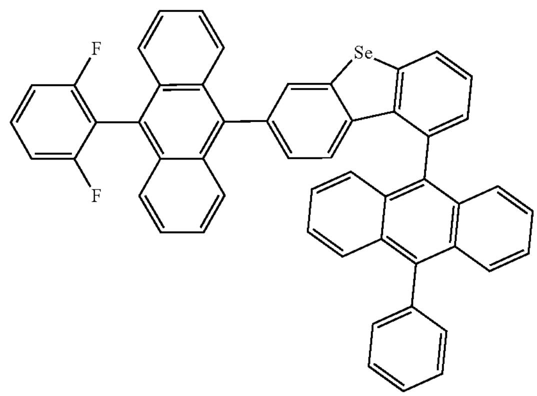
1926
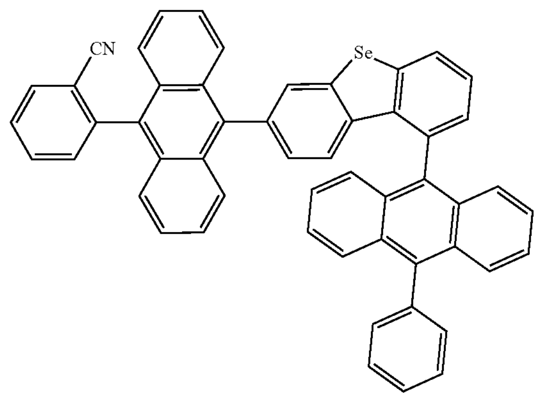

1927
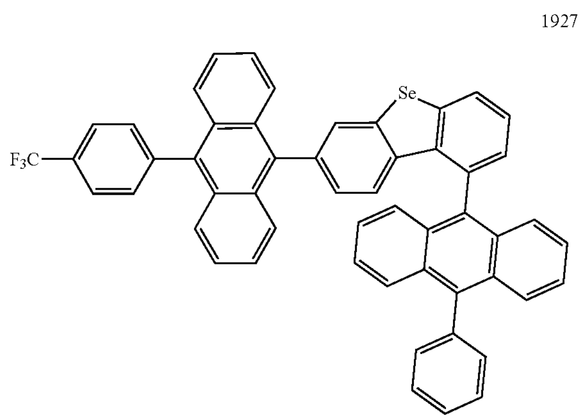
1928
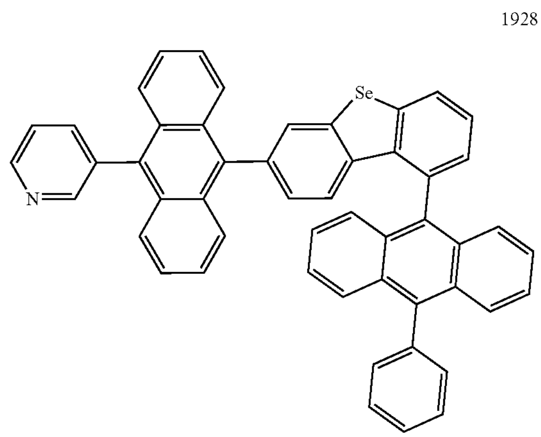
1929
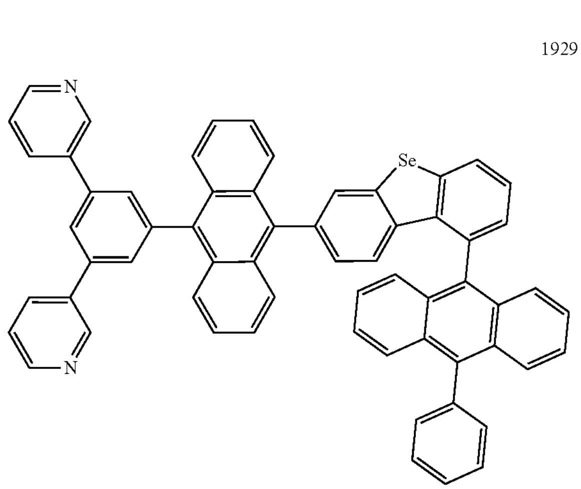
1930
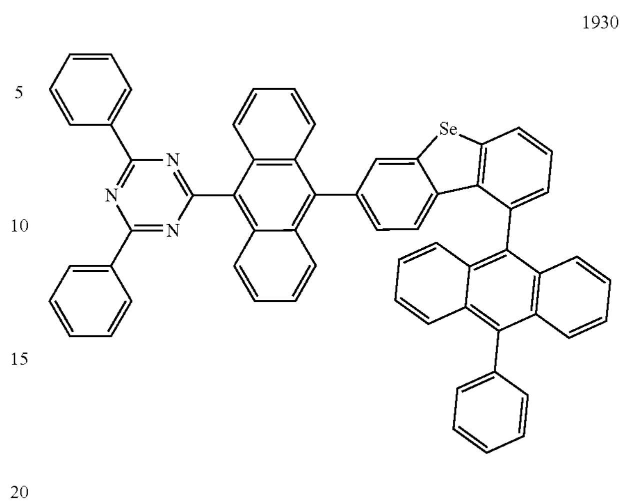
1931
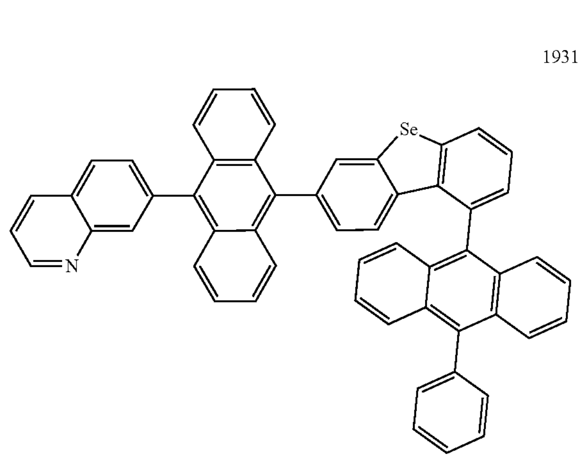
1932
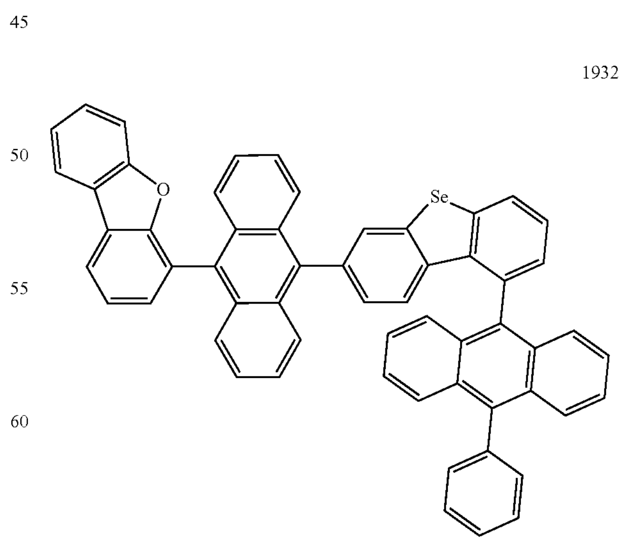

-continued
1933
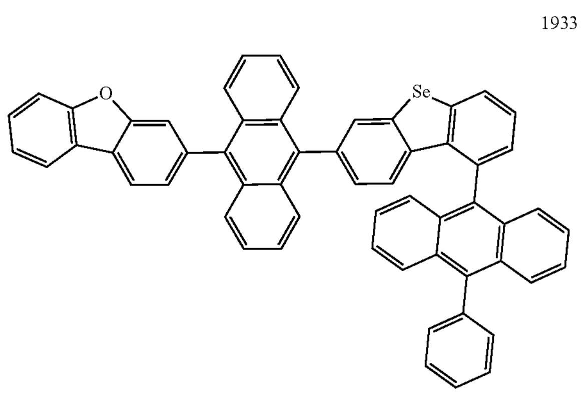
1934
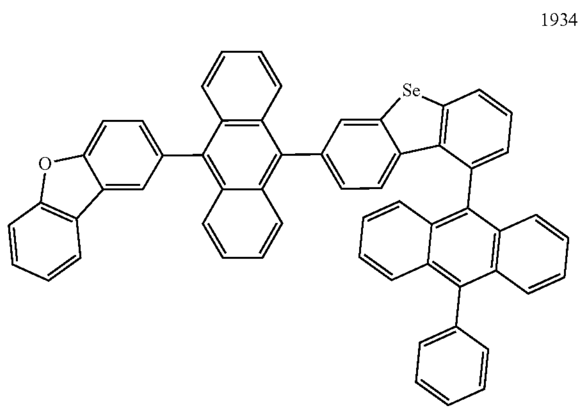
1935
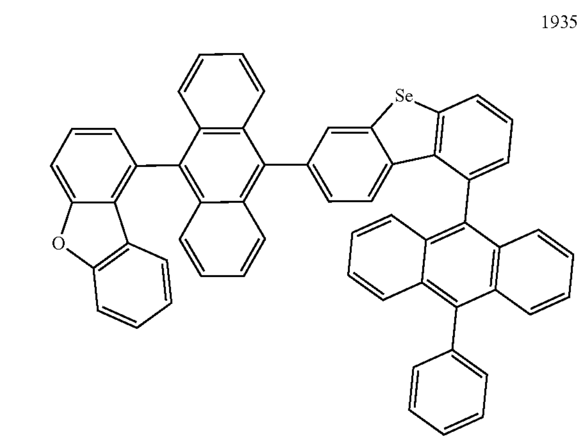
1936
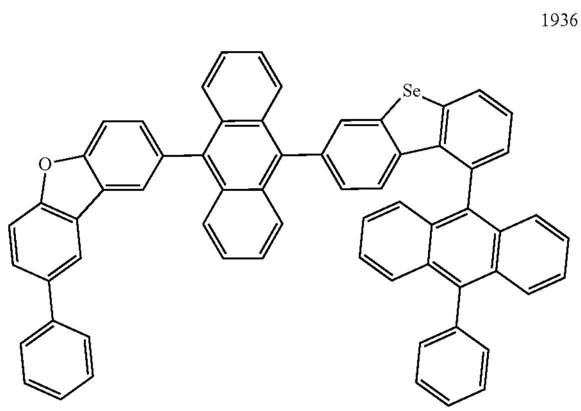
-continued
1937
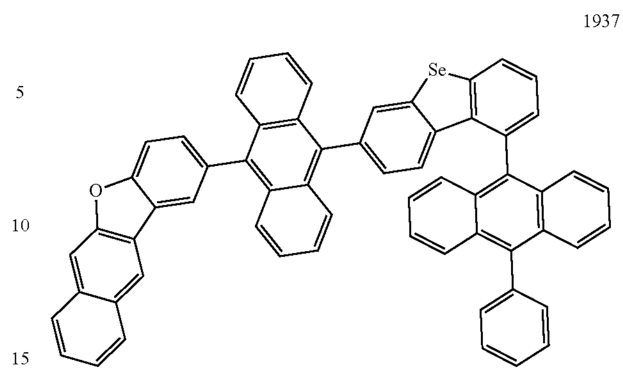
1938
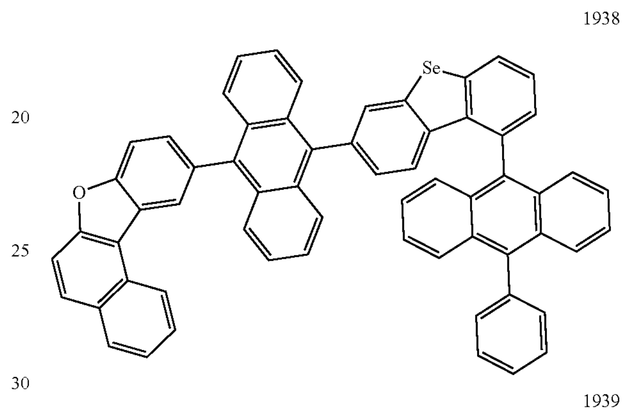
1939
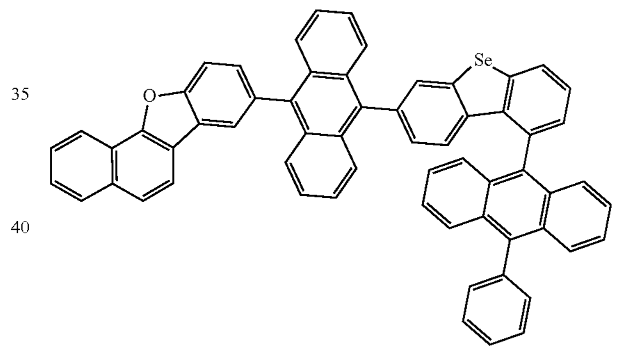
1940
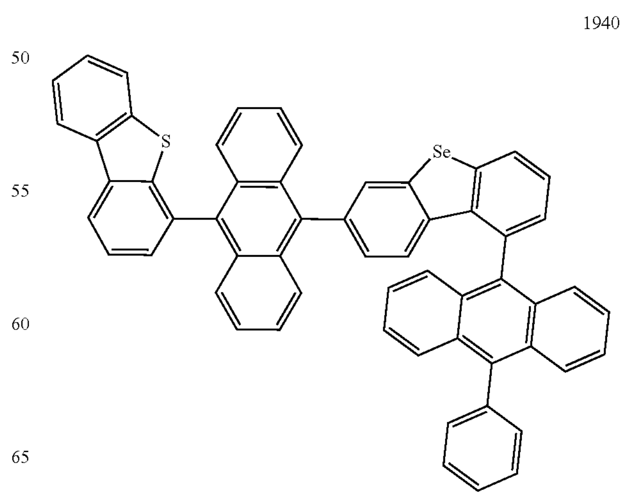

-continued
1941
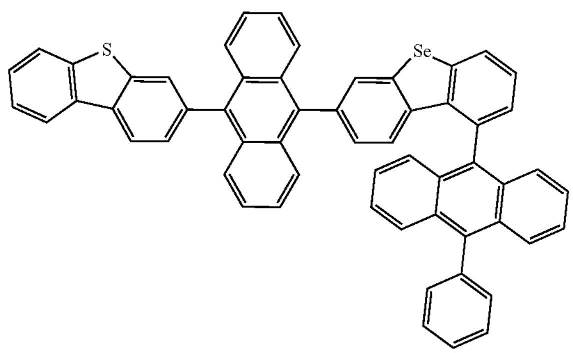
1942
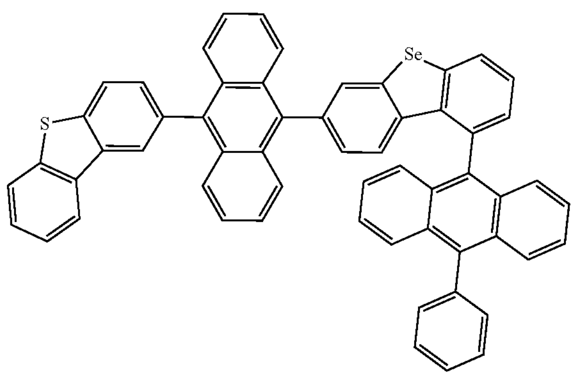
1943
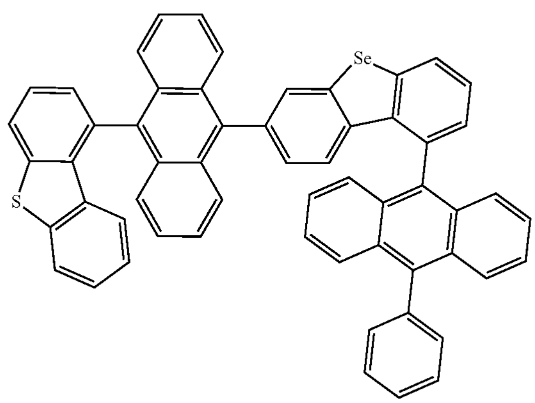
1944
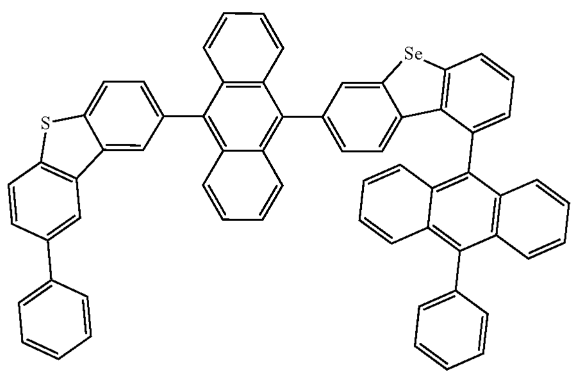
-continued
1945
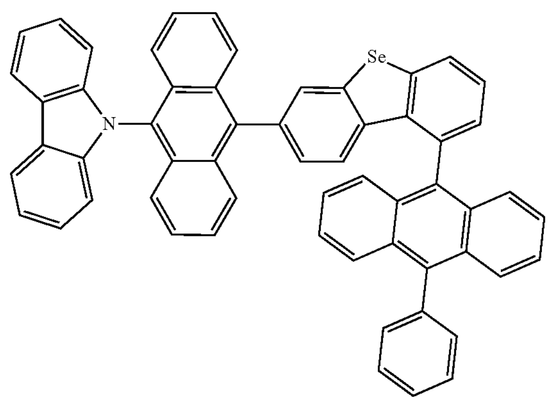
1946
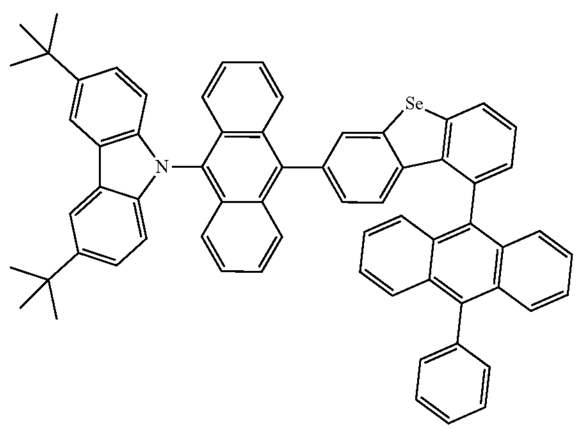
1947
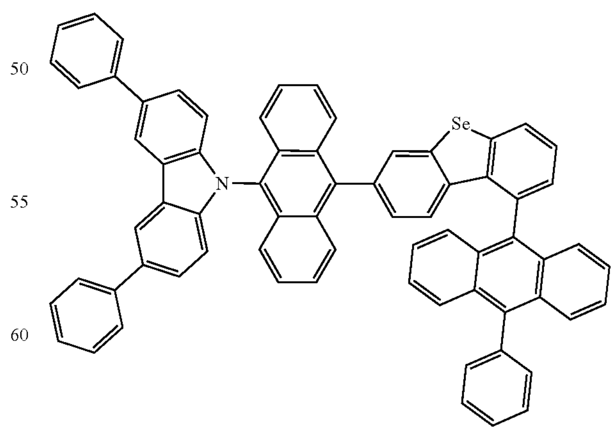

-continued
1948
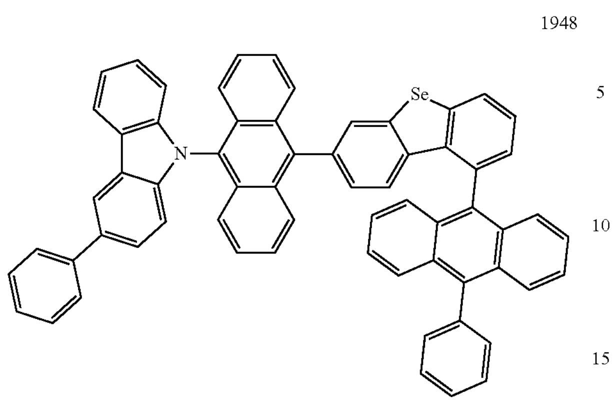
1949
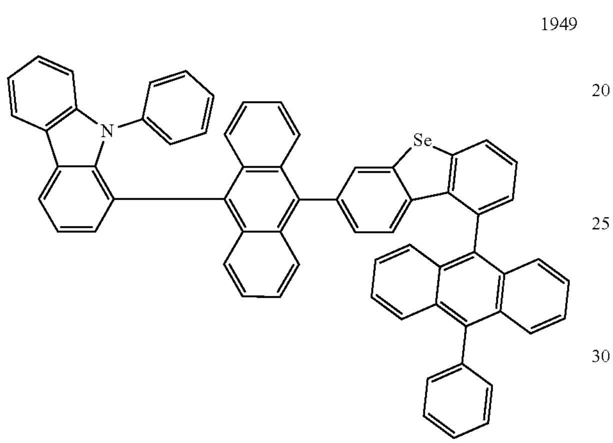
1950
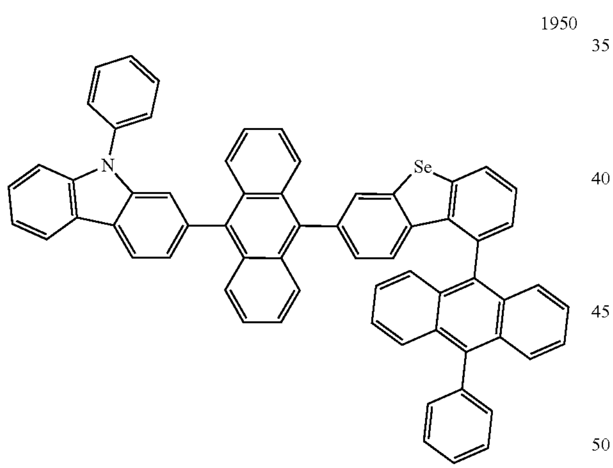
1951
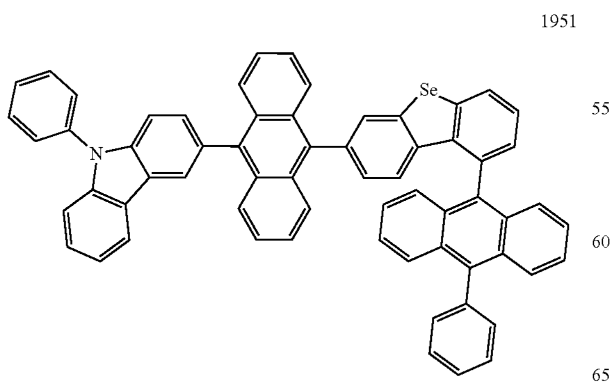
-continued
1952
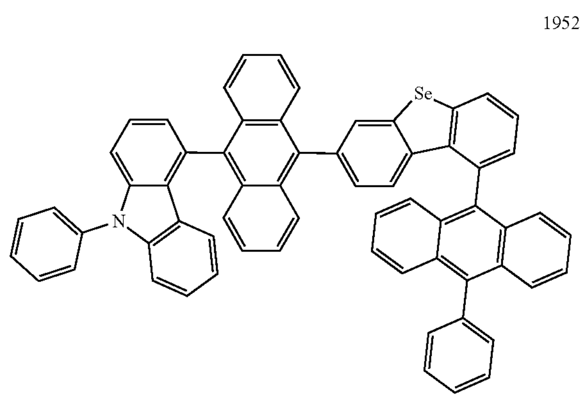
1953
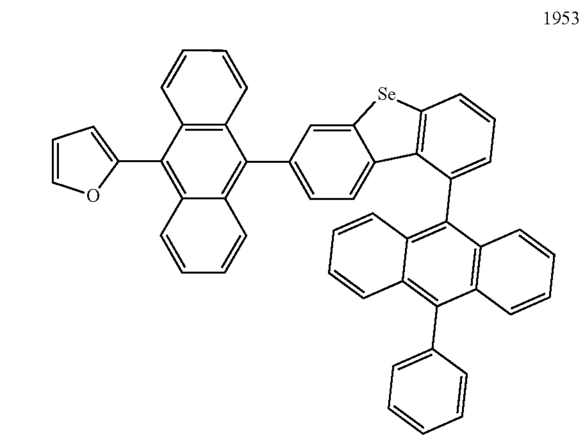
1954
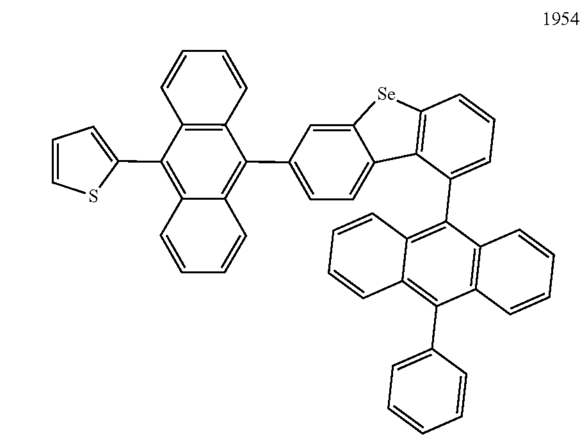
1955
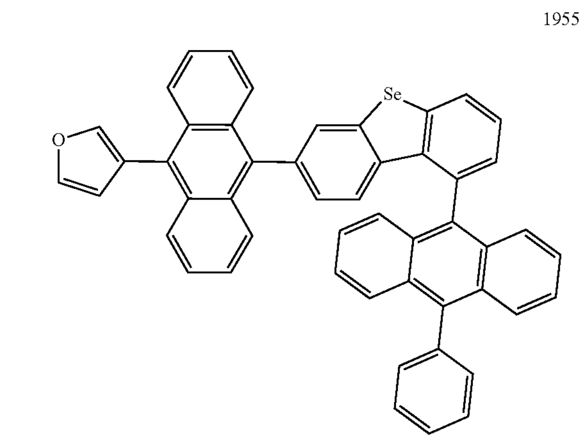

-continued
1956
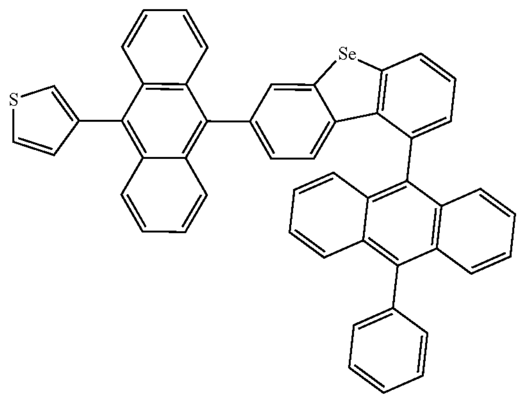
1957
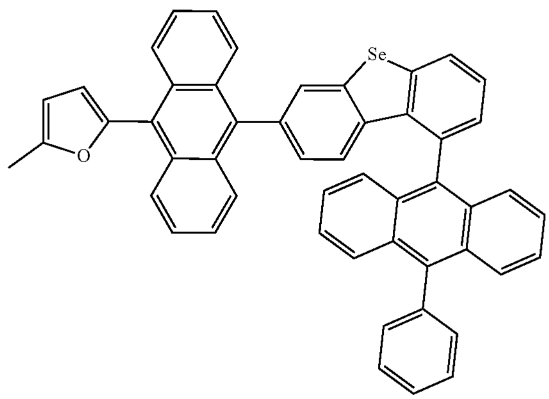
1958
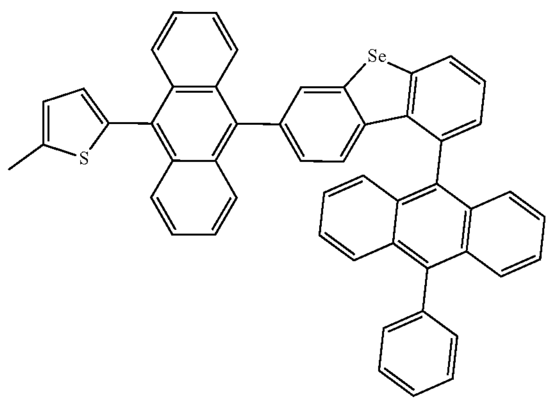
-continued
1959
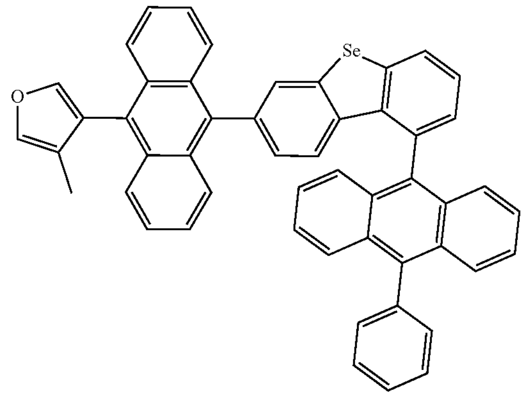
1960
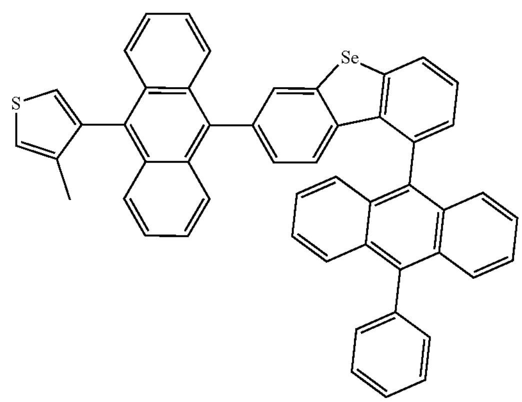
1961
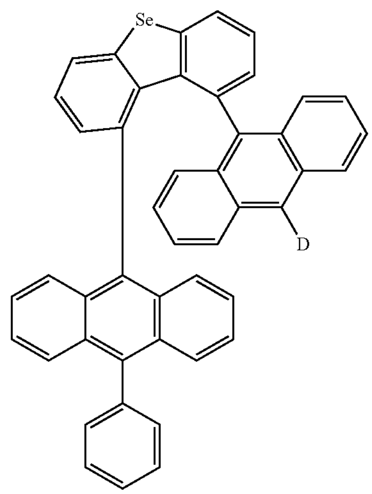

-continued
1962
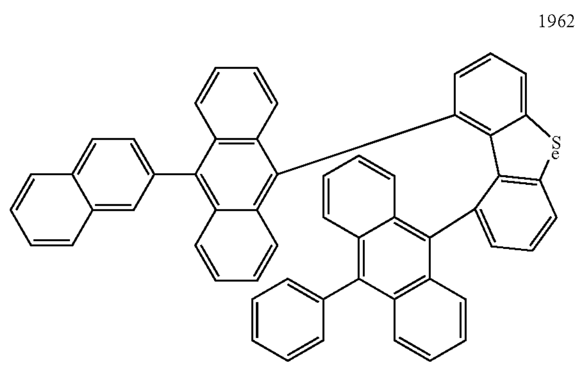
1963
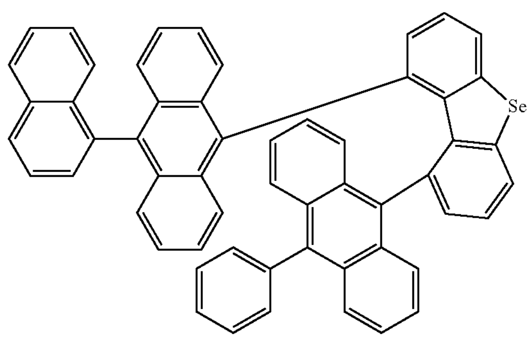
1964
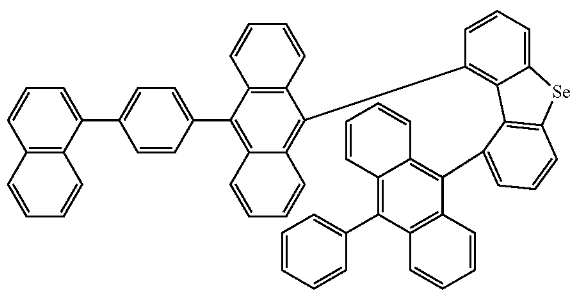
1965
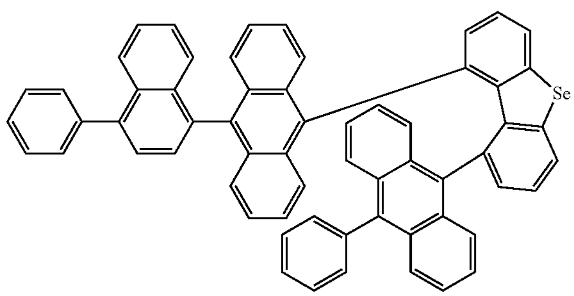
-continued
1966
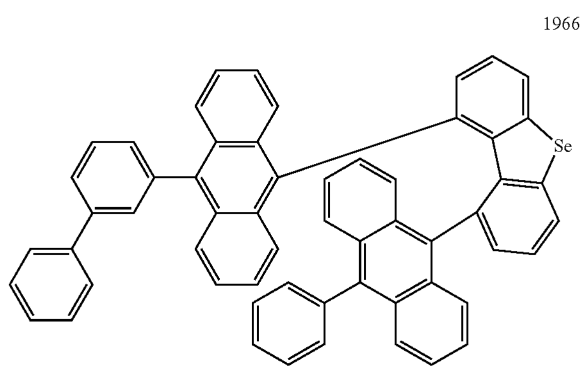
1967
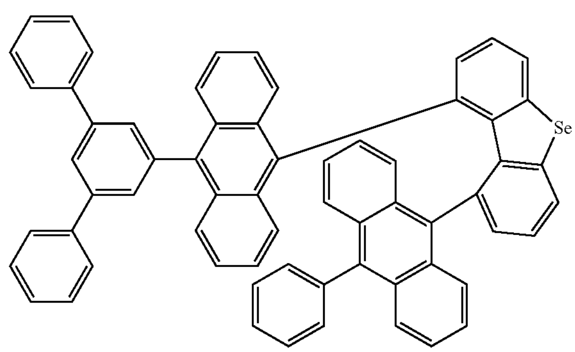
1968
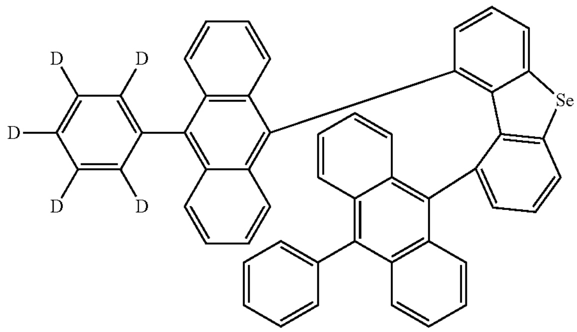
1969
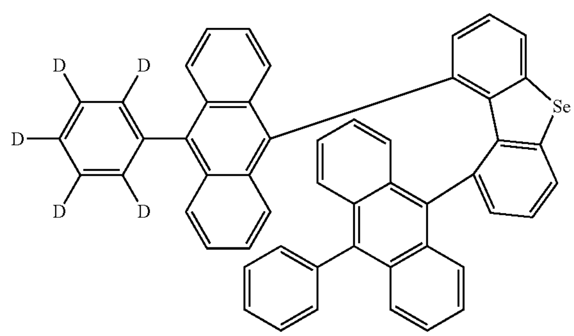

-continued
1970
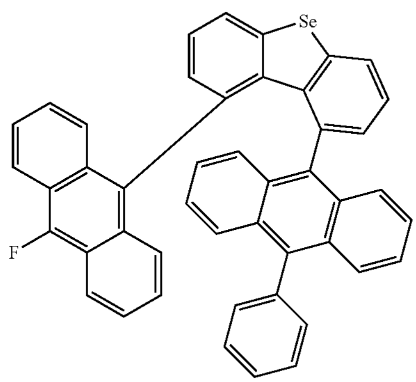
1971
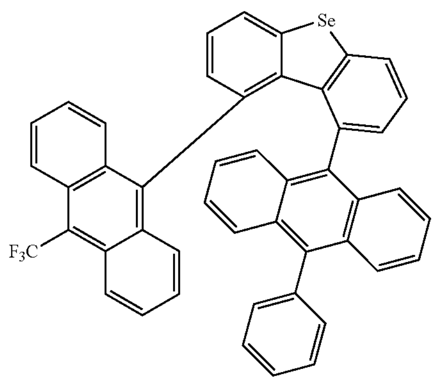
1972
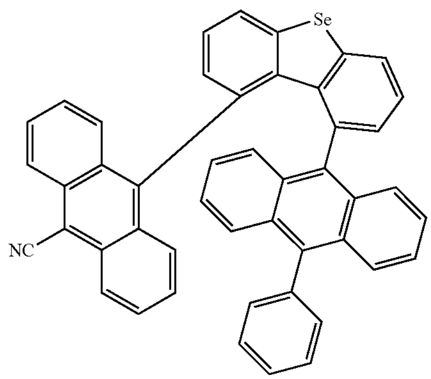
1973
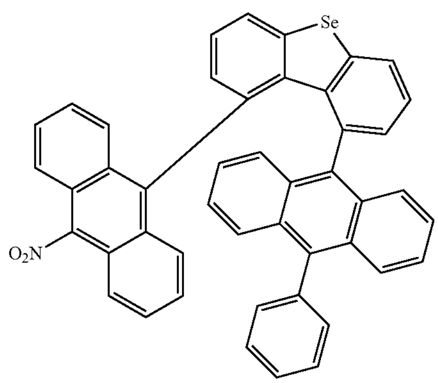
-continued
1974
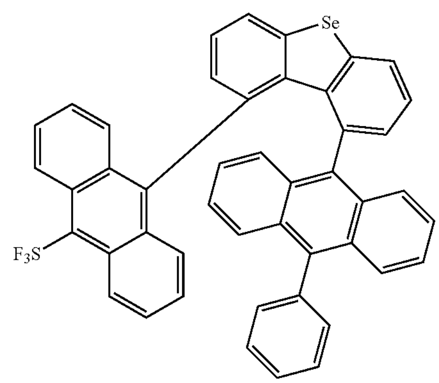
1975
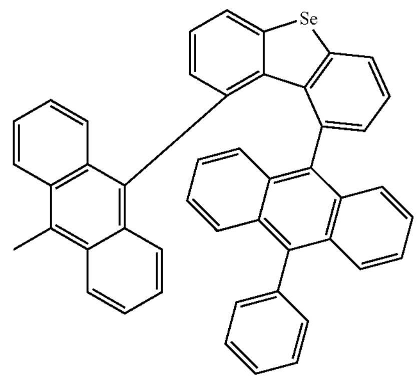
1976
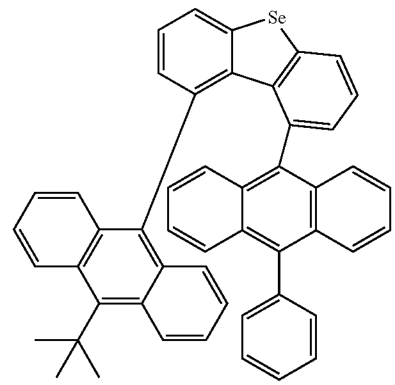
1977
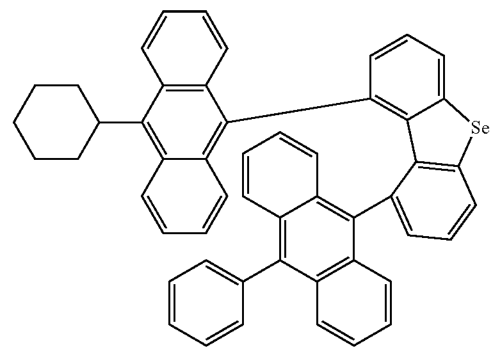

-continued
1978
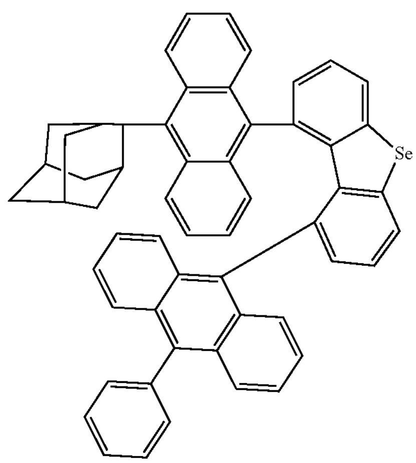
1979
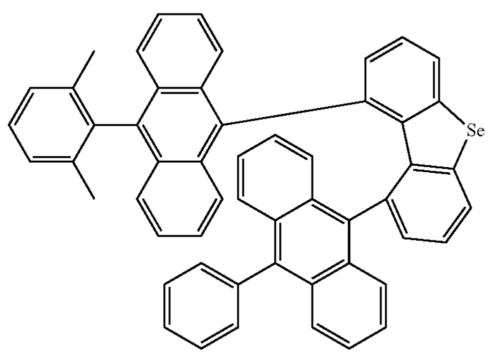
1980
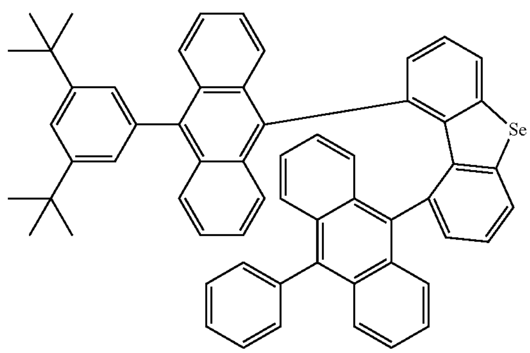
1981
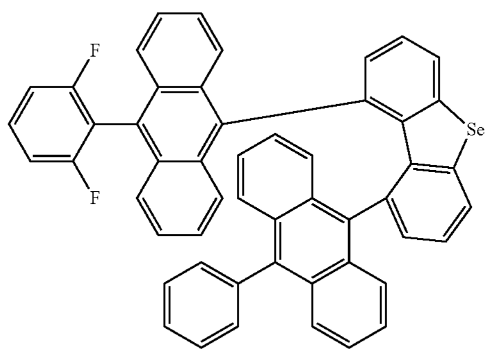
-continued
1982
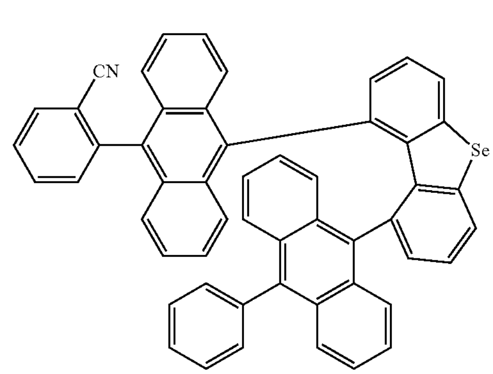
1983
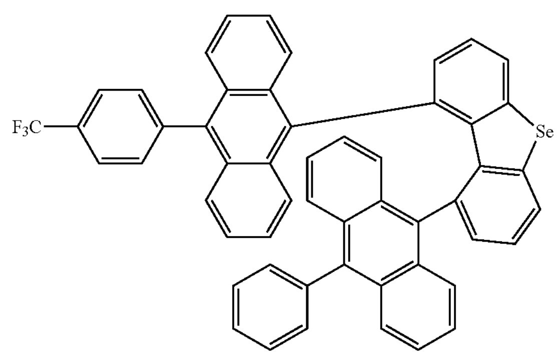
1984
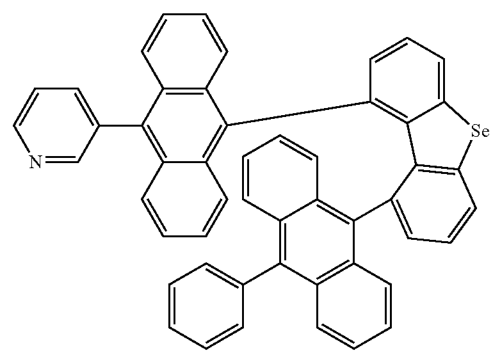
1985
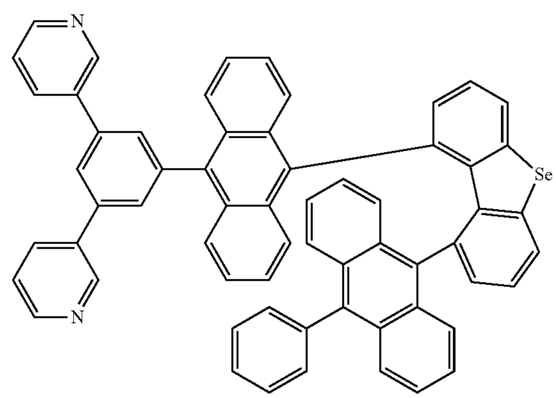

-continued
1986
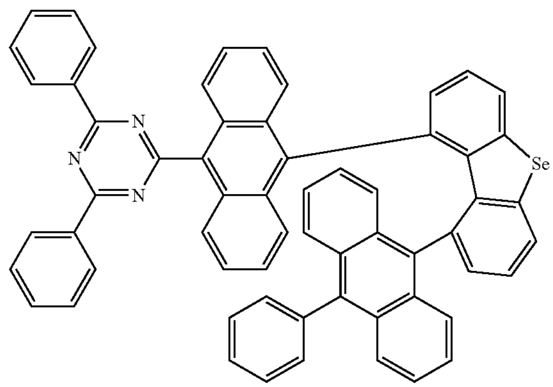
1987
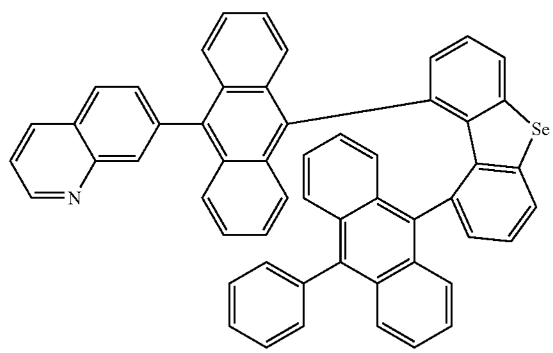
1988
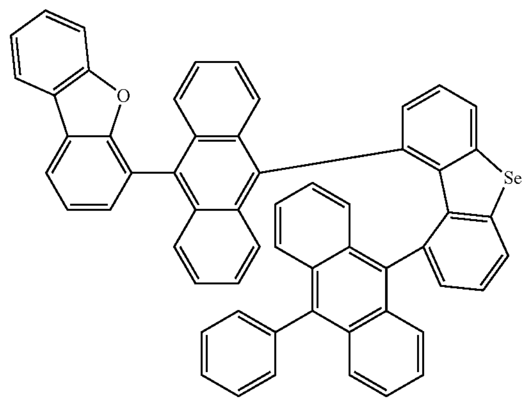
-continued
1989
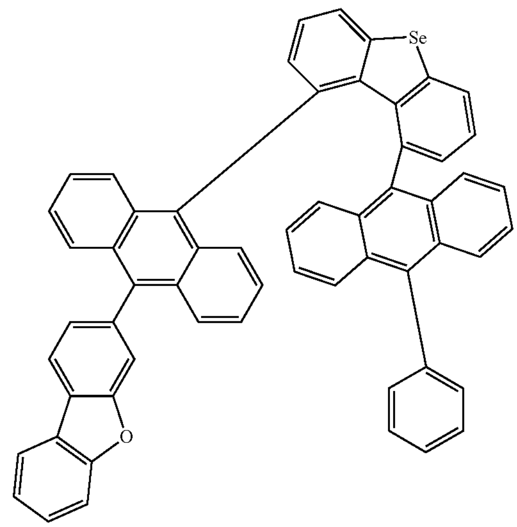
1990
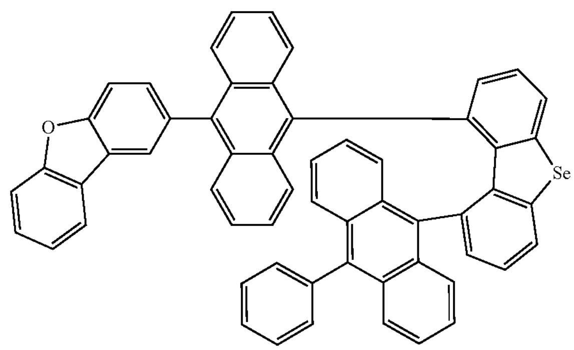
1991
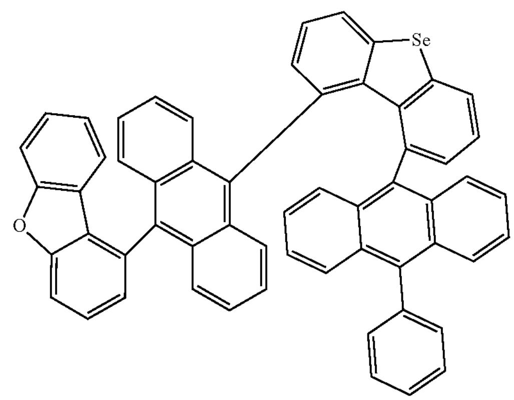

-continued
1992
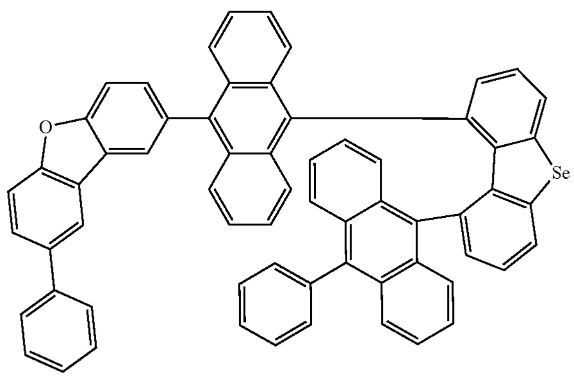
1993
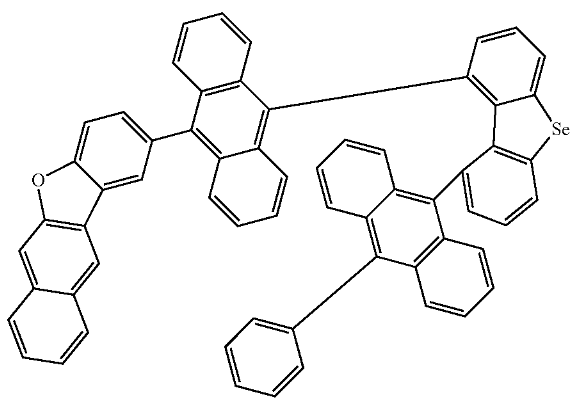
1994
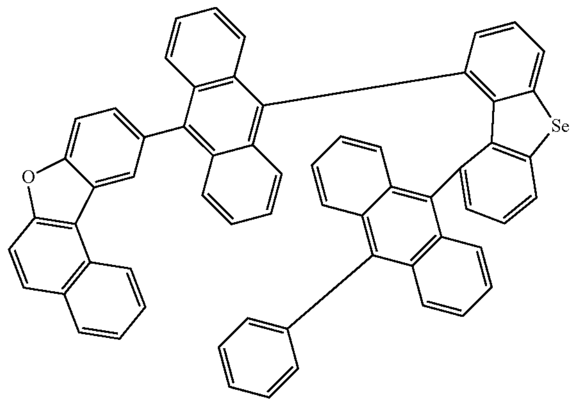
1995
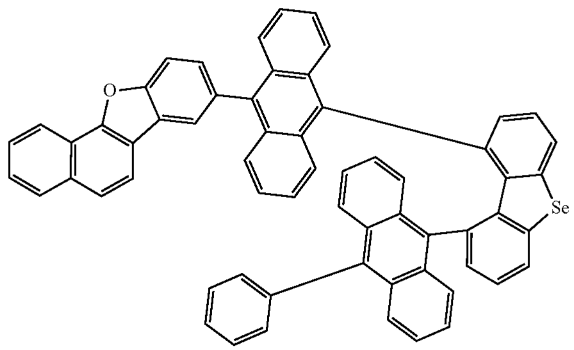
-continued
1996
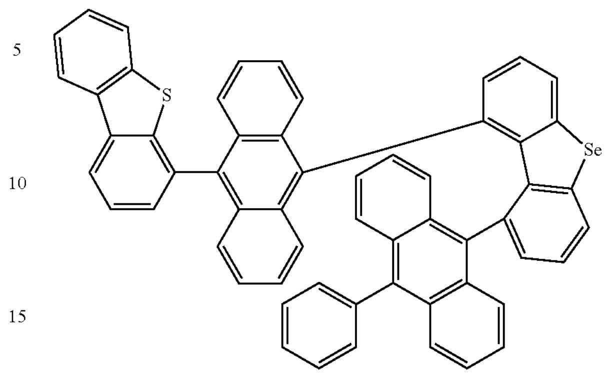
1997
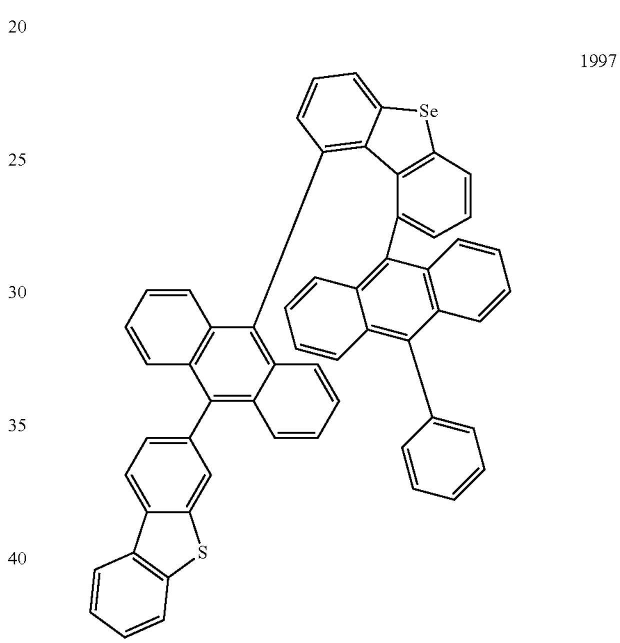
1998
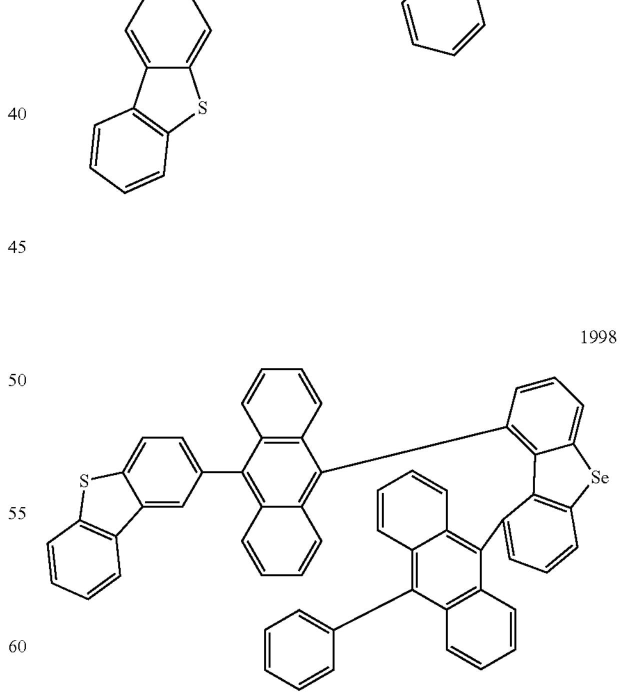
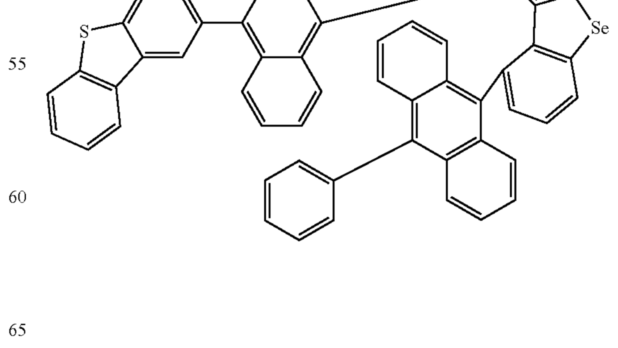

-continued
1999
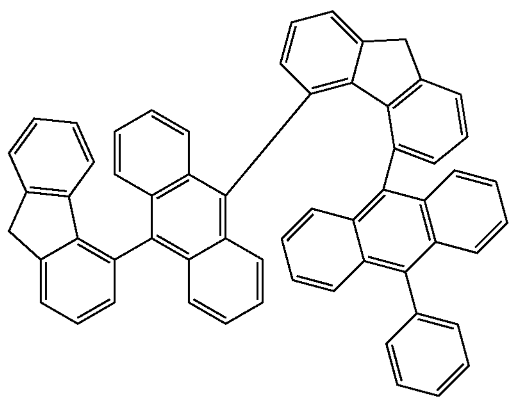
2000
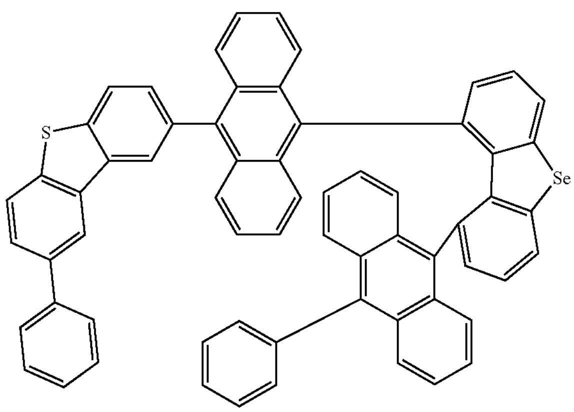
2001
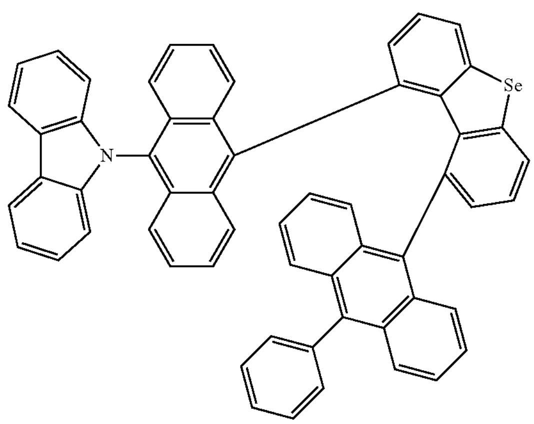
-continued
2002
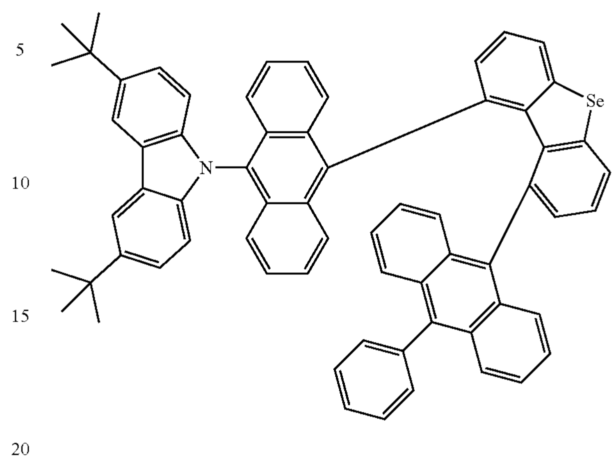
2003
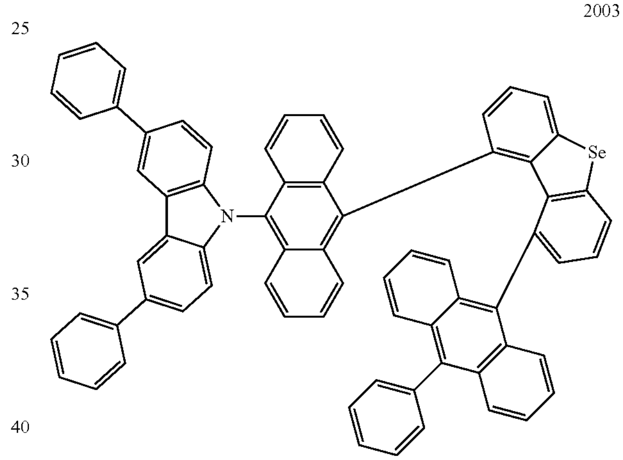
2004
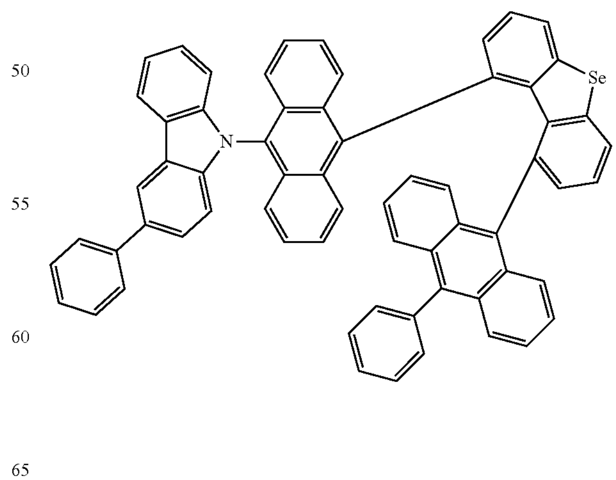

-continued
2005
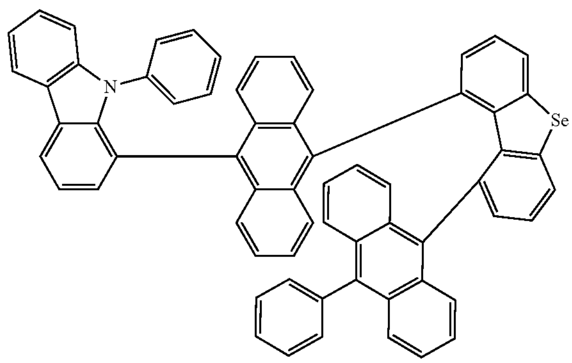
2006
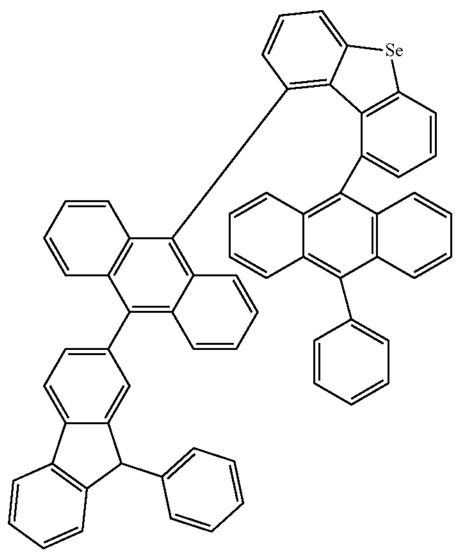
2007
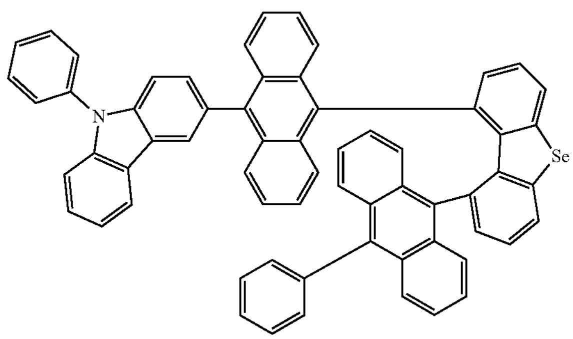
-continued
2008
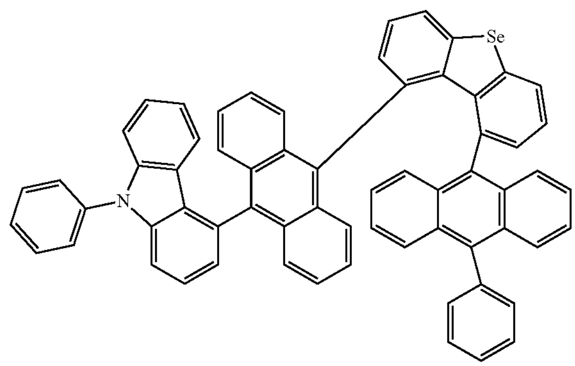
2009
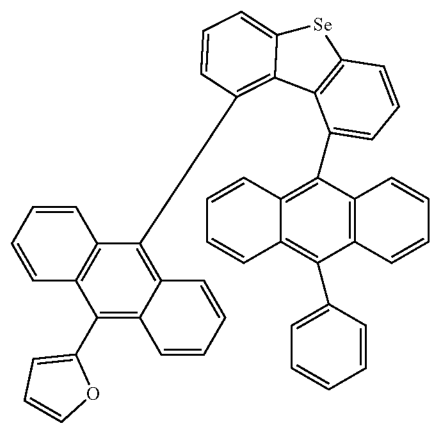
2010
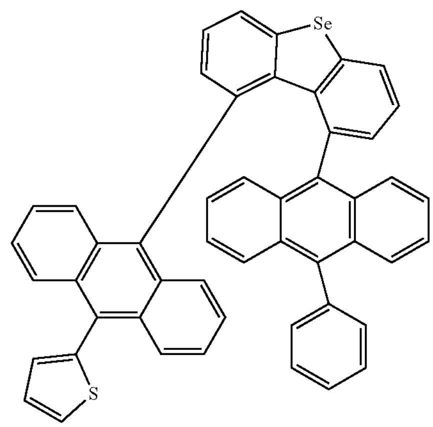
2011
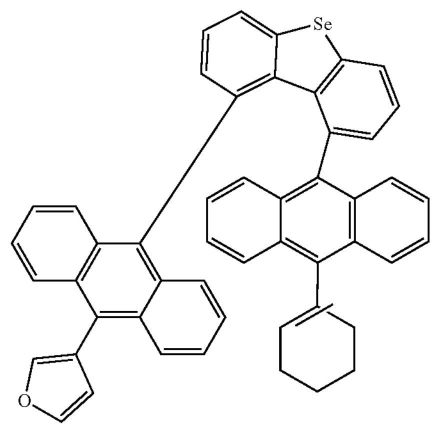

-continued
2012
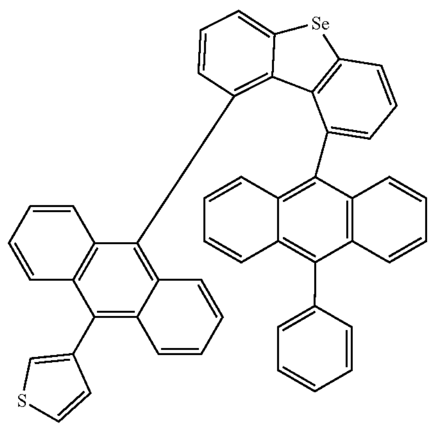
2013
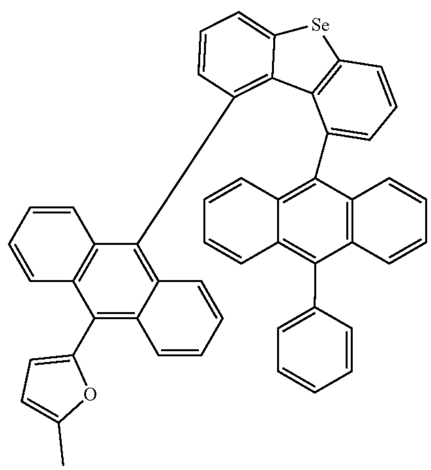
2014
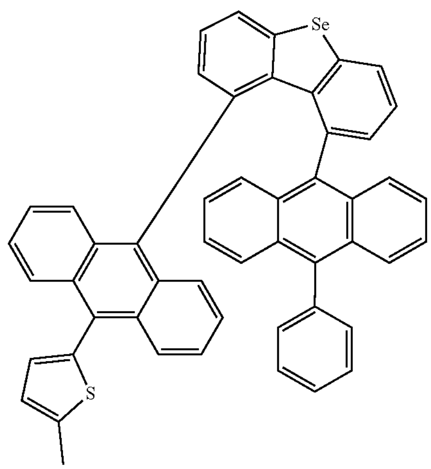
2015
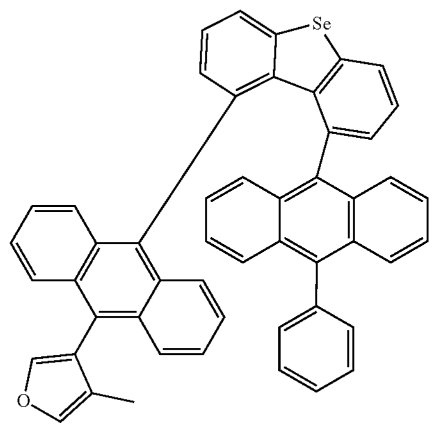
2016
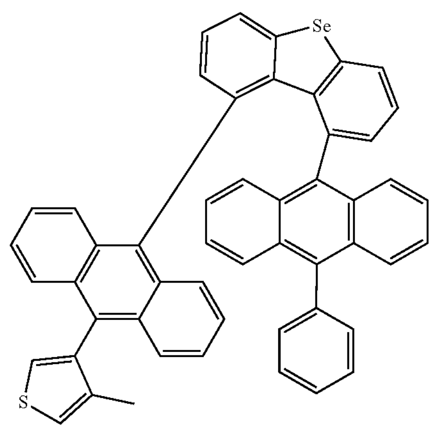
2017
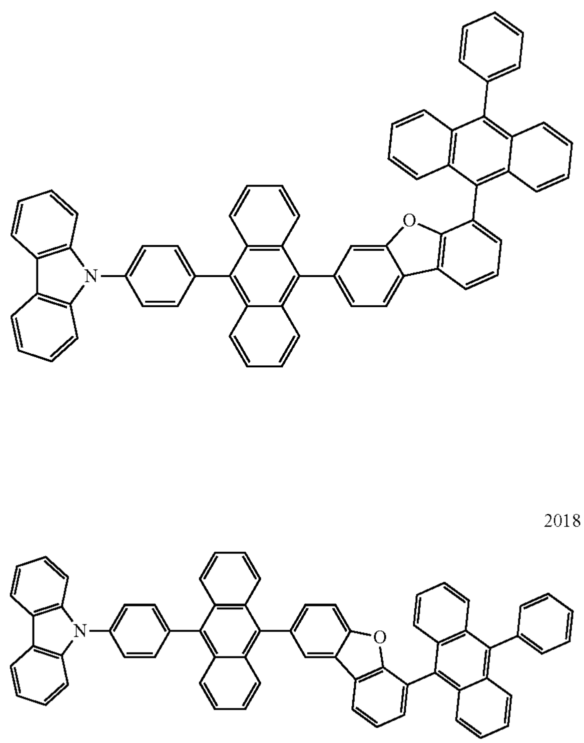
2018

-continued
2019
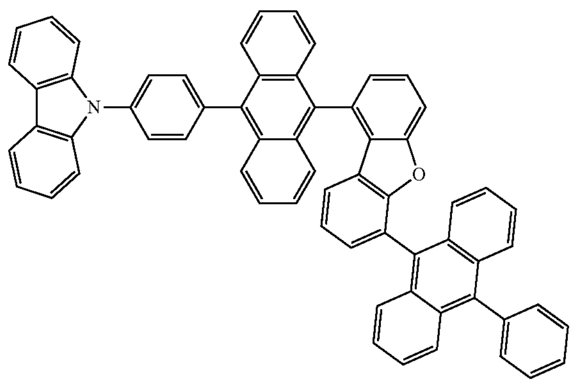
2020
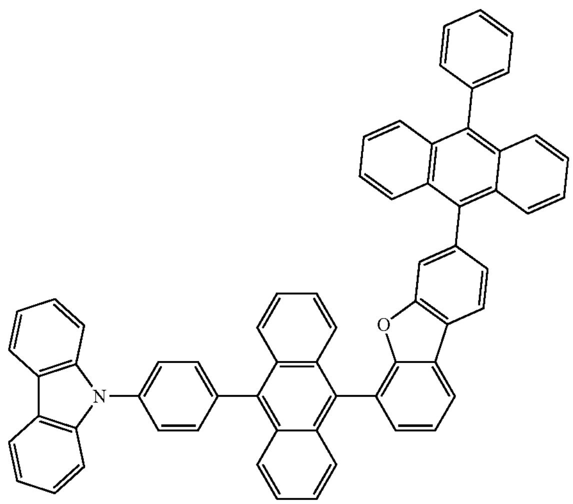
2021
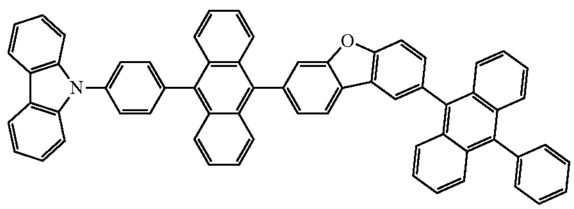
2022
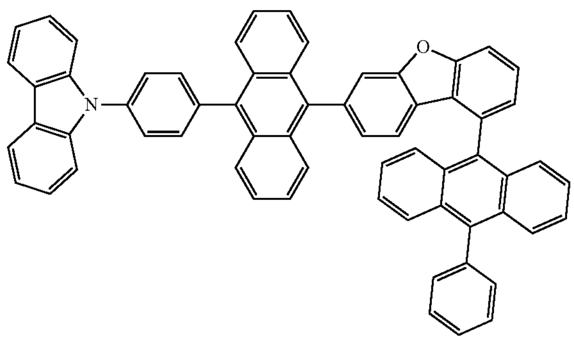
-continued
2023
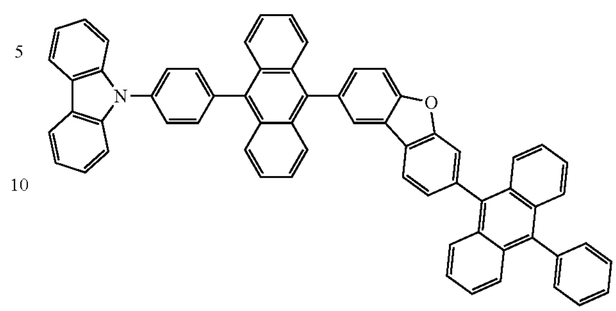
2024
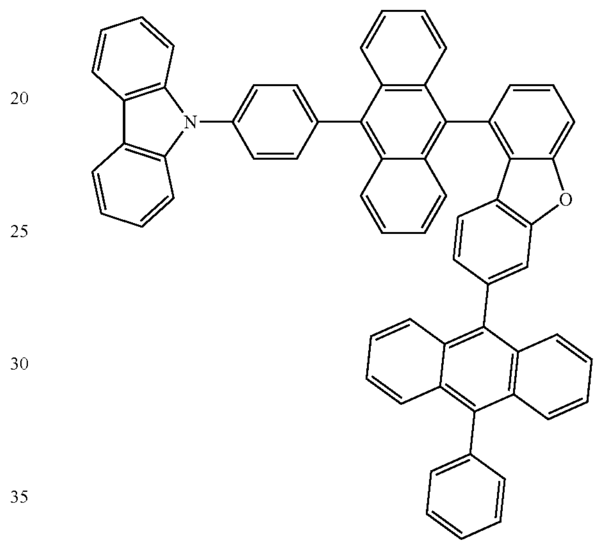
2025
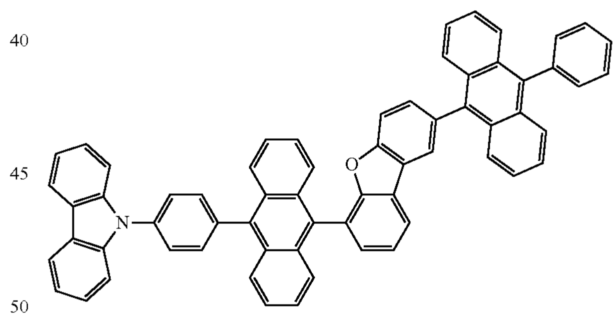
2026
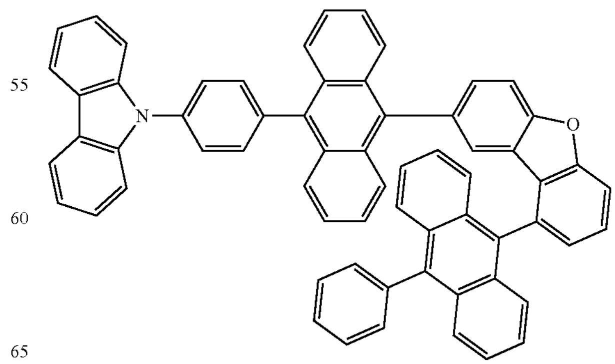

-continued
2027
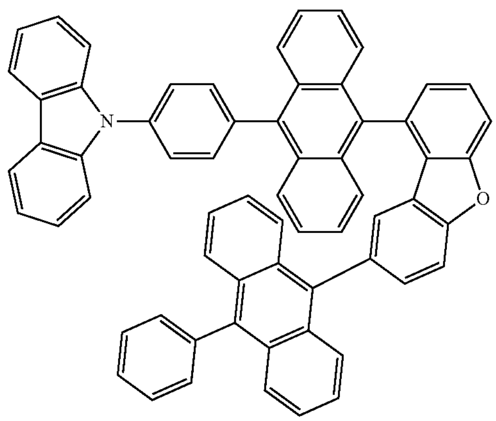
2028
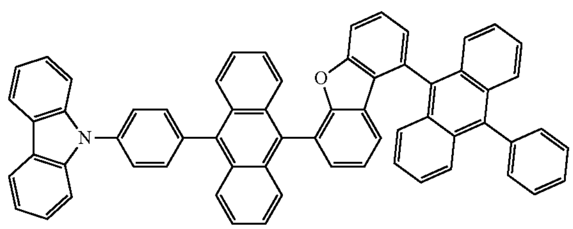
2029
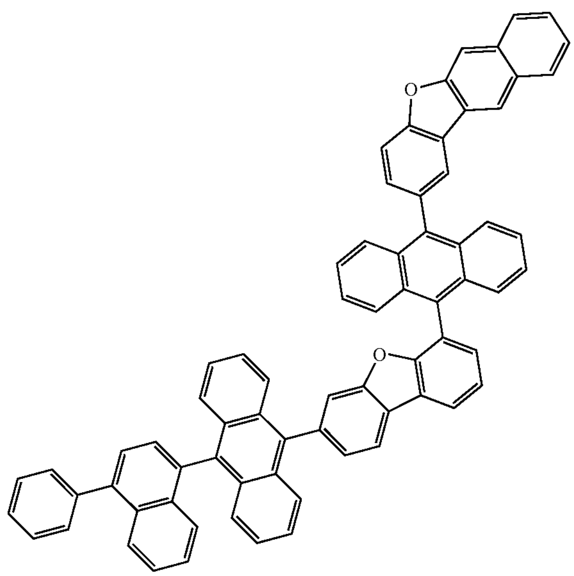
2030
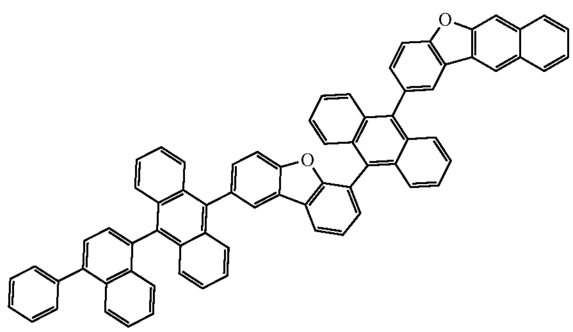
-continued
2031
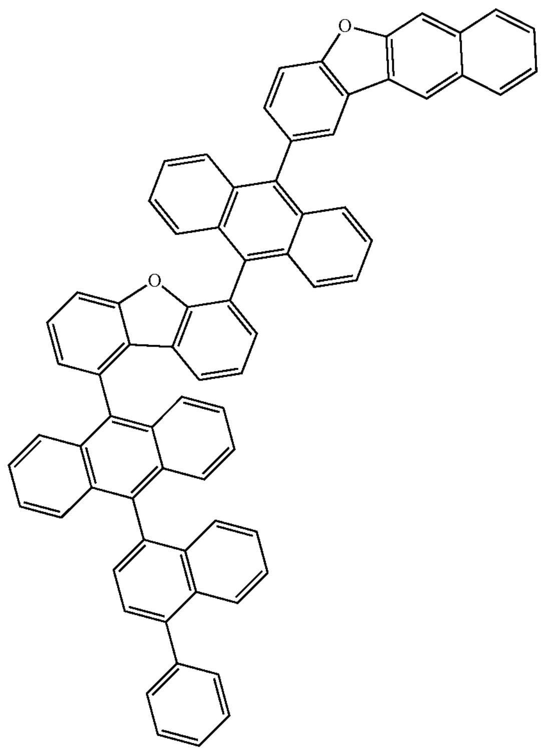
2032
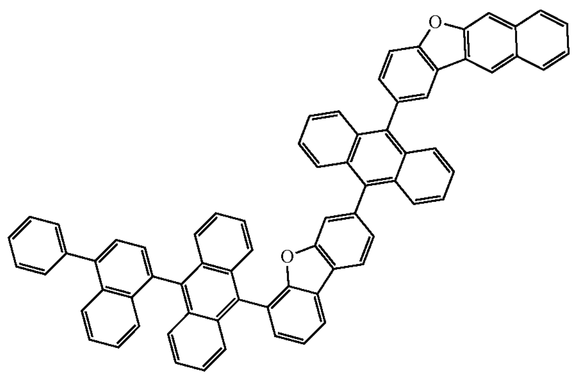

-continued
2033
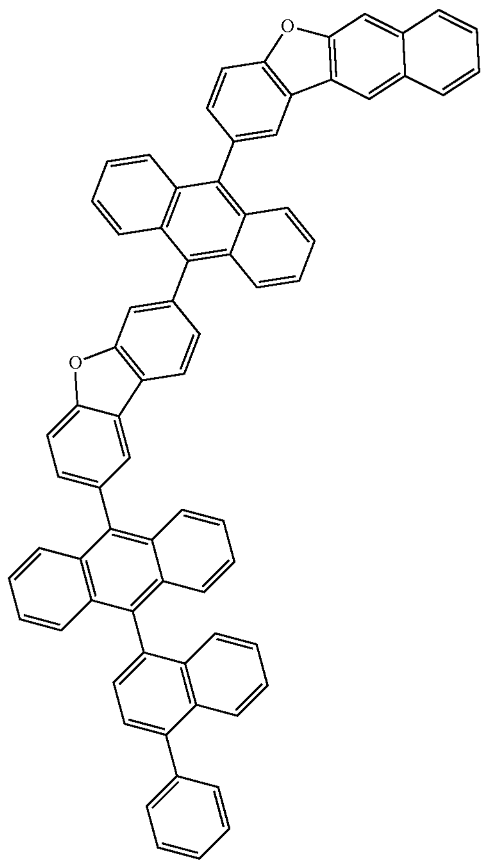
2034
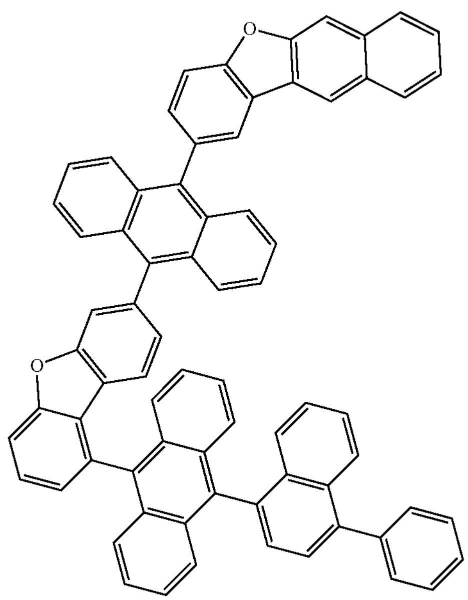
-continued
2035
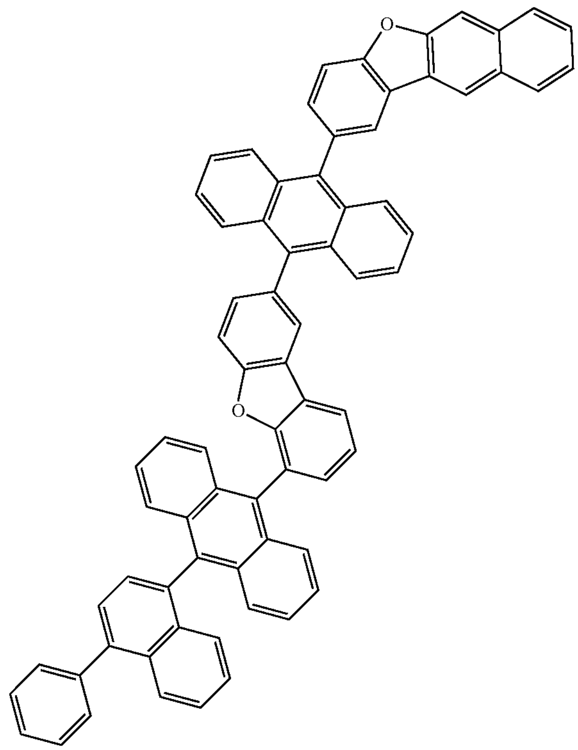
2036
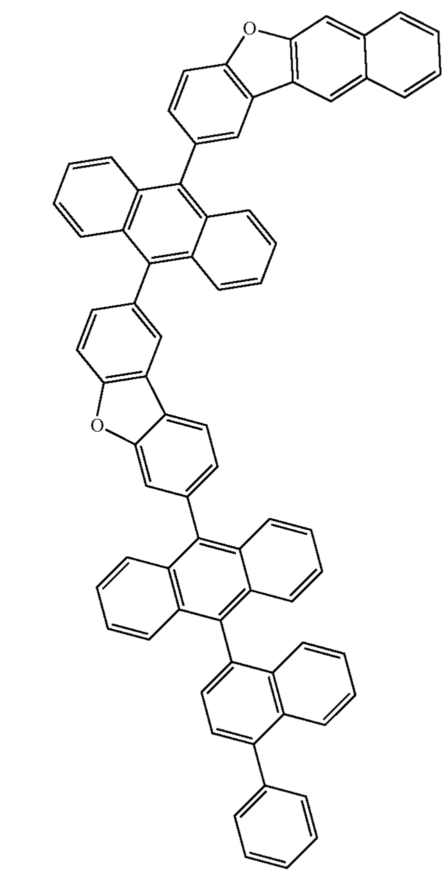

-continued
2037
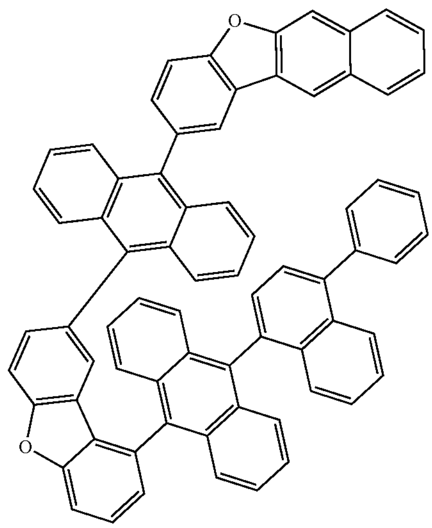
2038
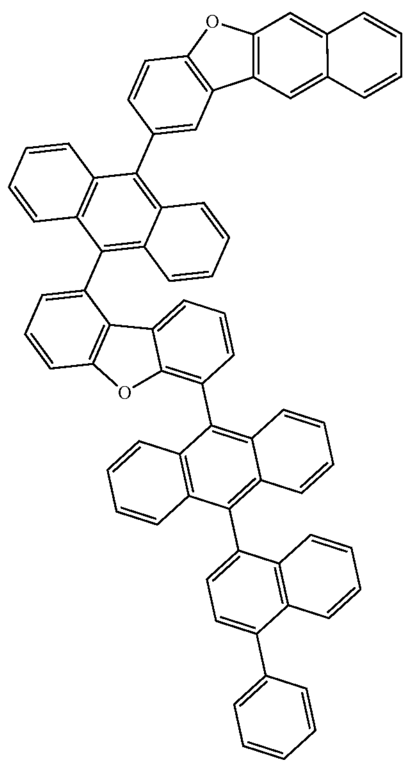
-continued
2039
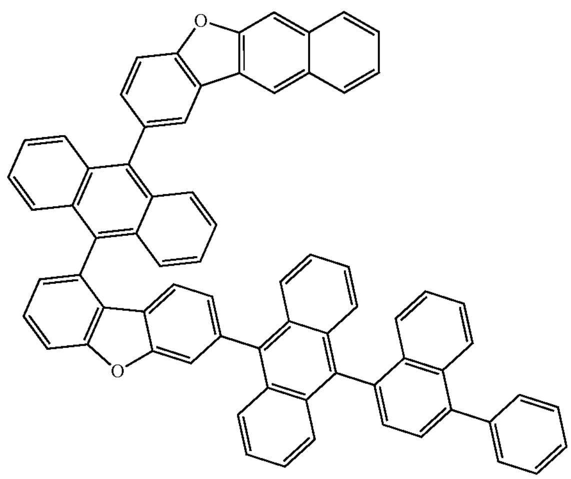
2040
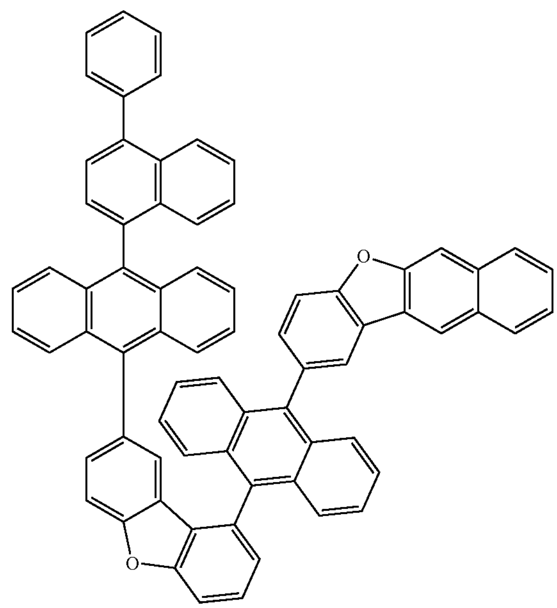
2041
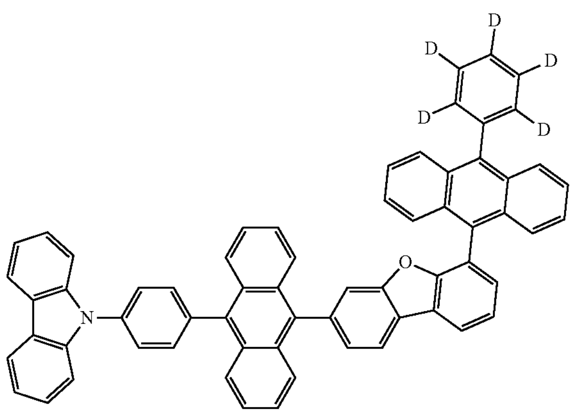

-continued
2042
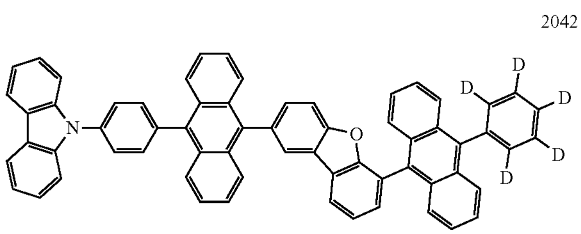
2043
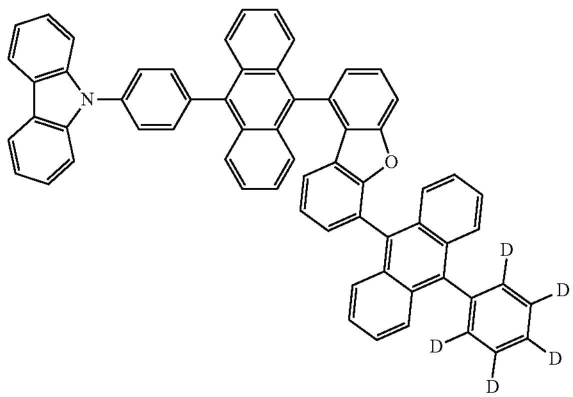
2044
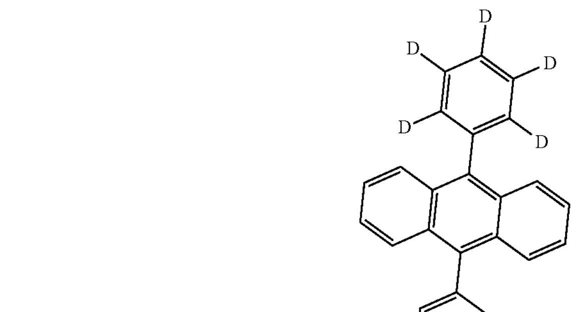
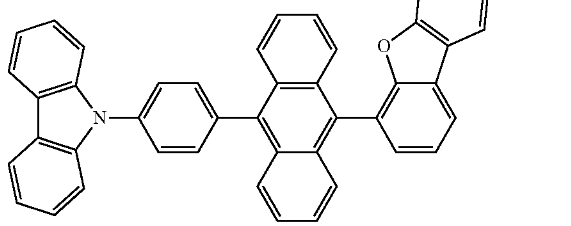
2045
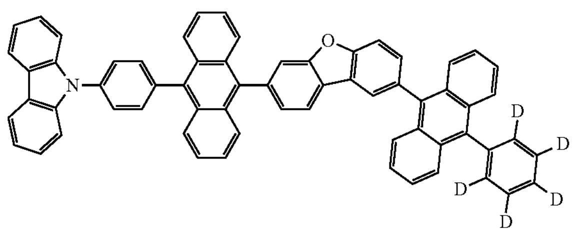
-continued
2046
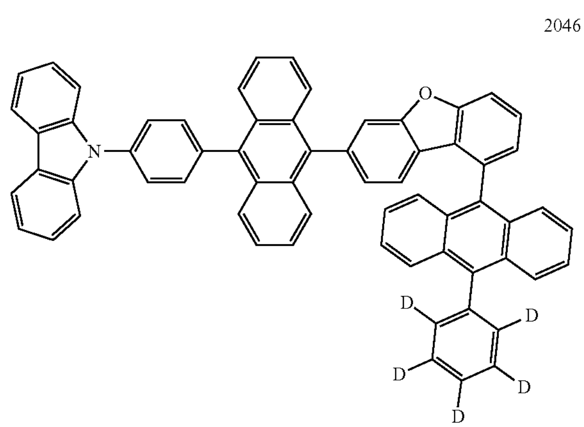
2047
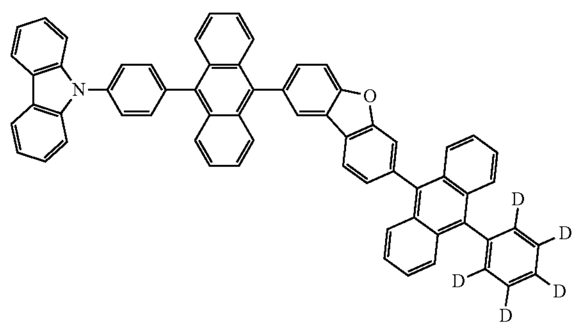
2048
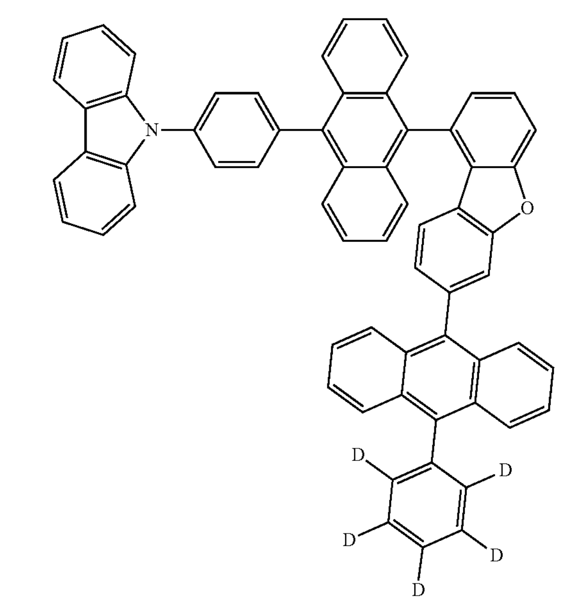

-continued
2049
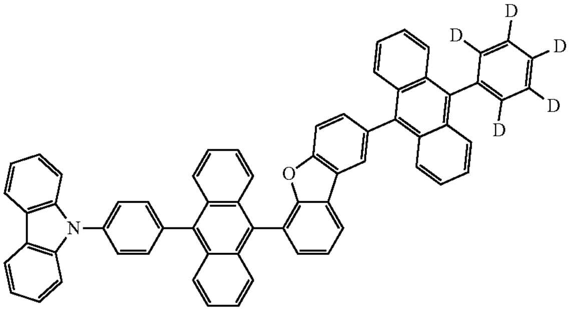
2050
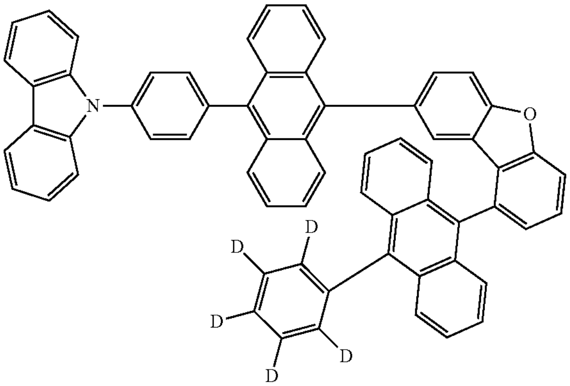
2051
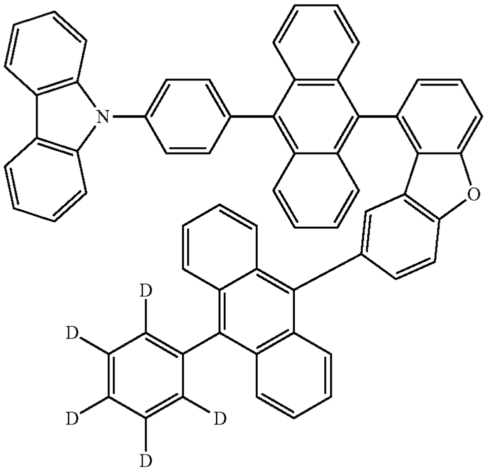
2052
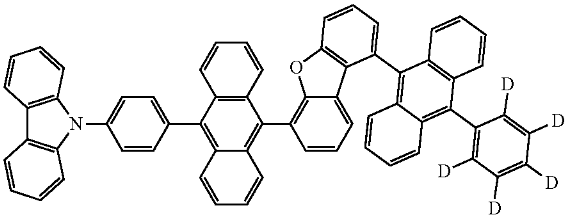
-continued
2053
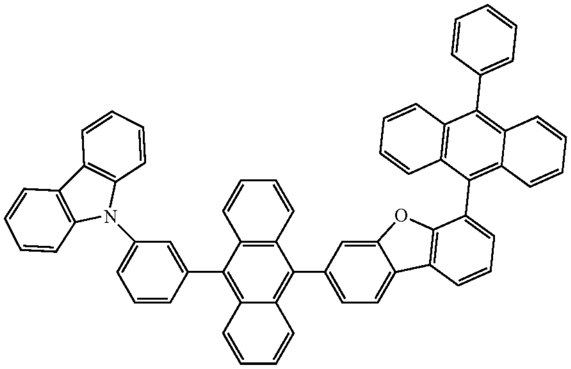
2054
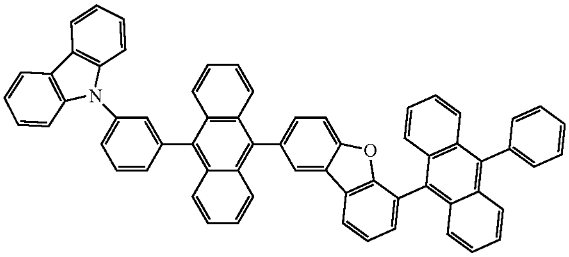
2055
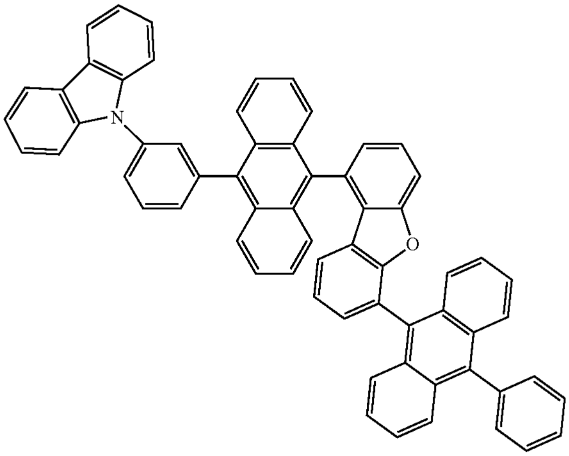

-continued
2056
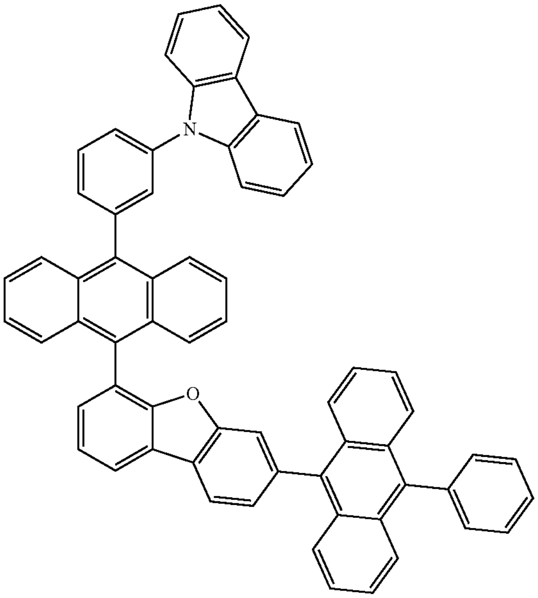
2057
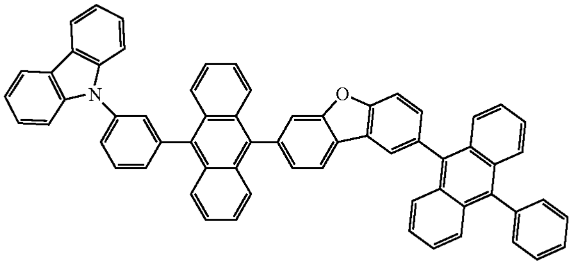
2058
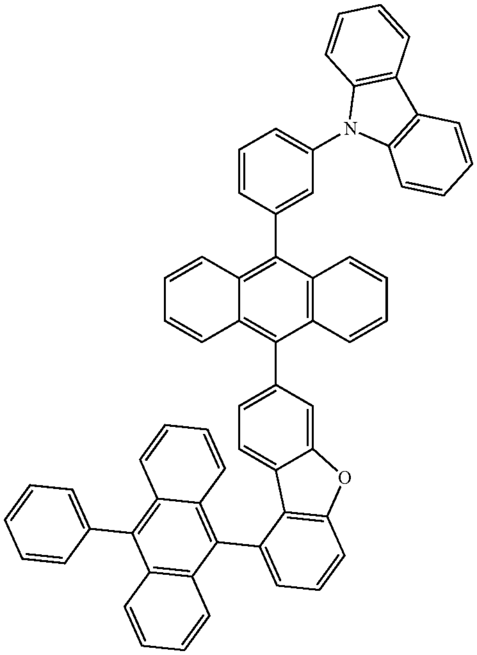
-continued
2059
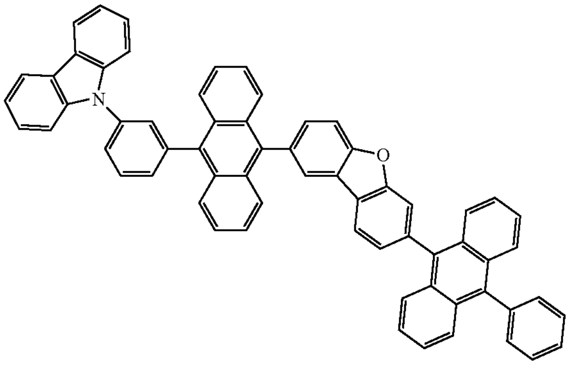
2060
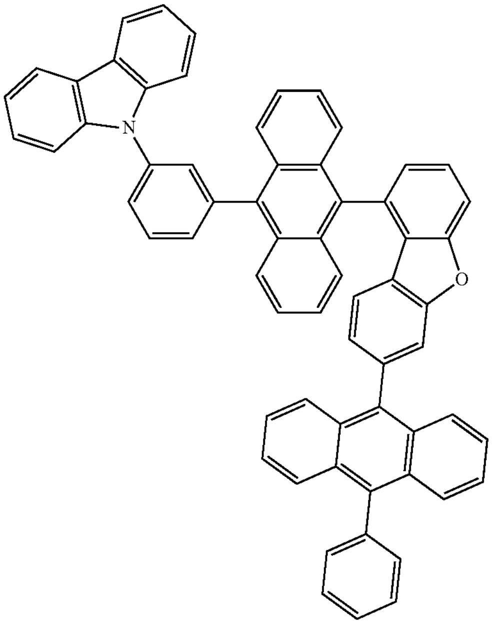
2061
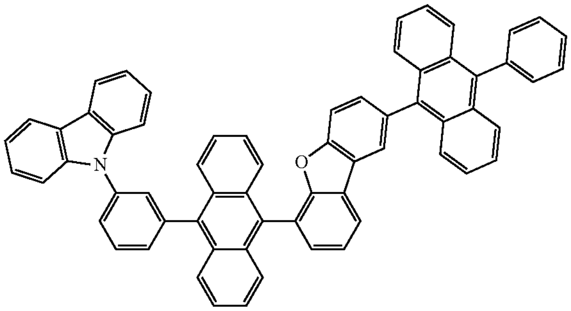

-continued
2062
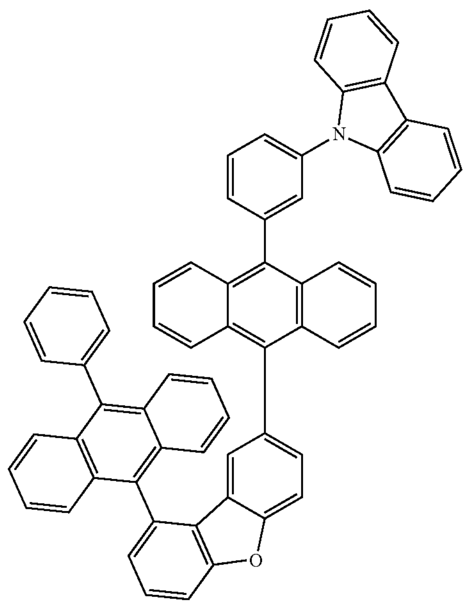
2063
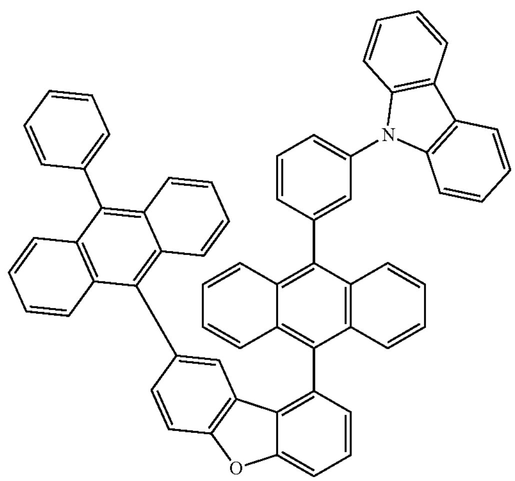
2064
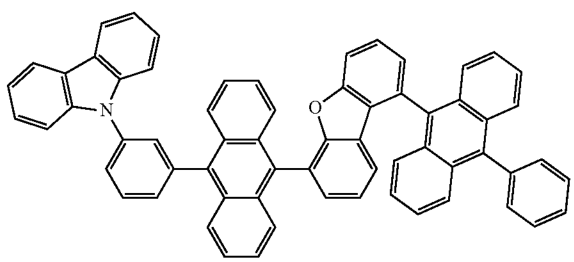
-continued
2065
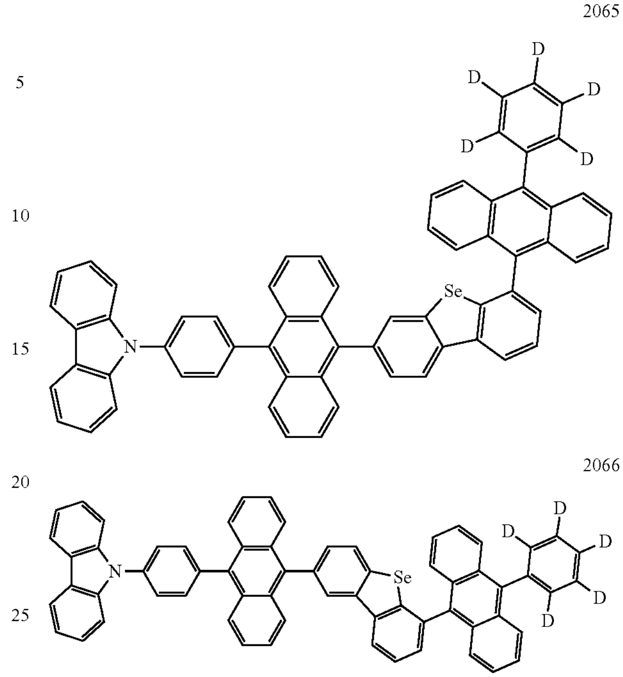
2066
2067
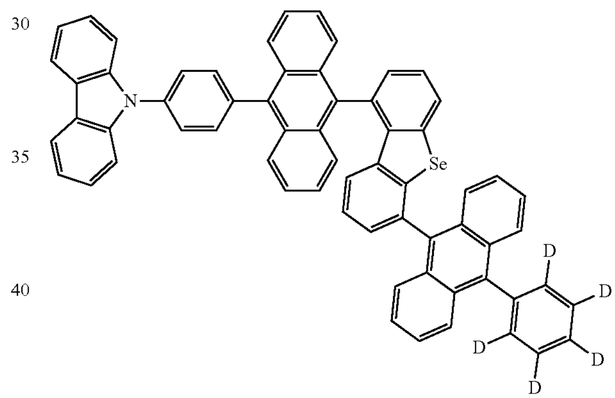
2068
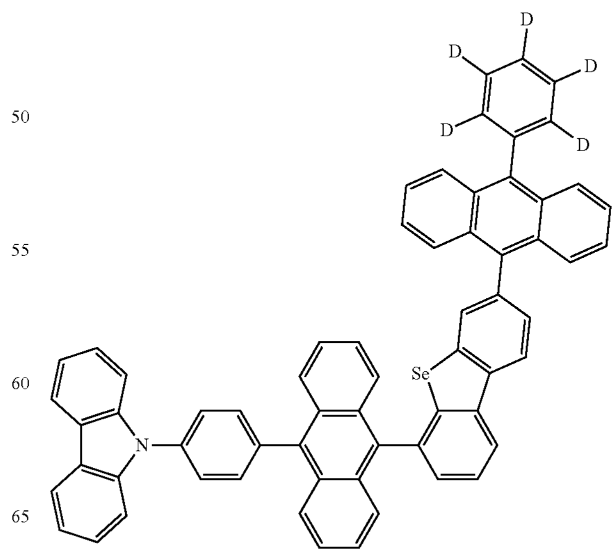

-continued
2069
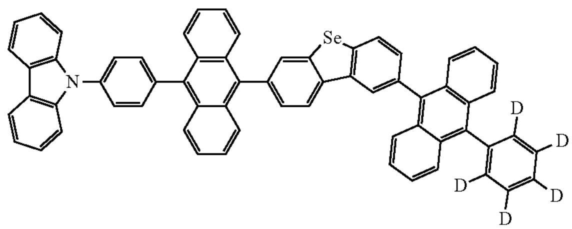
2070
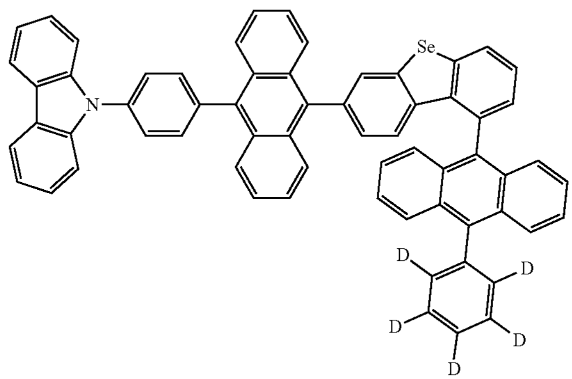
2071
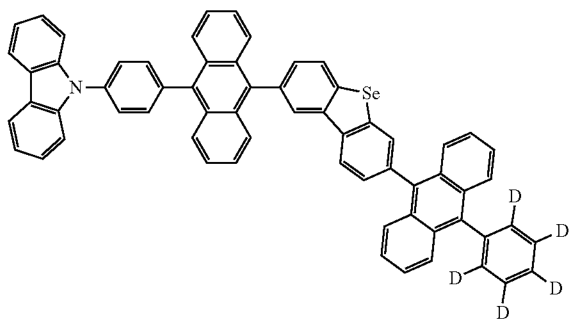
2072
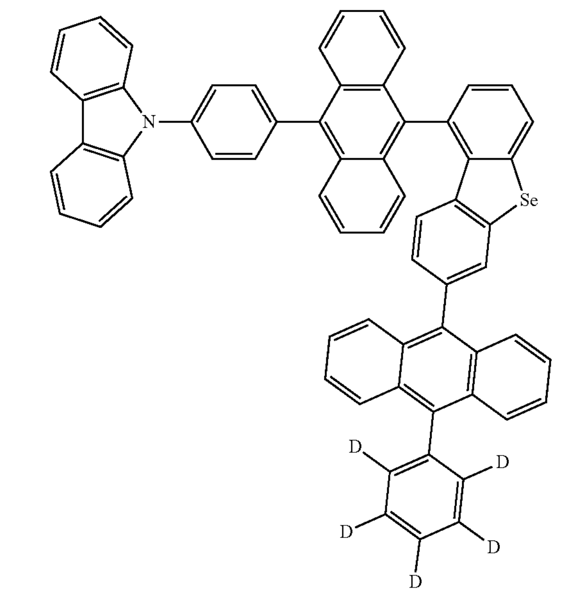
-continued
2073
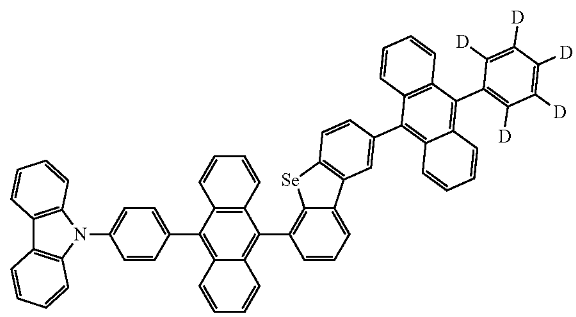
2074
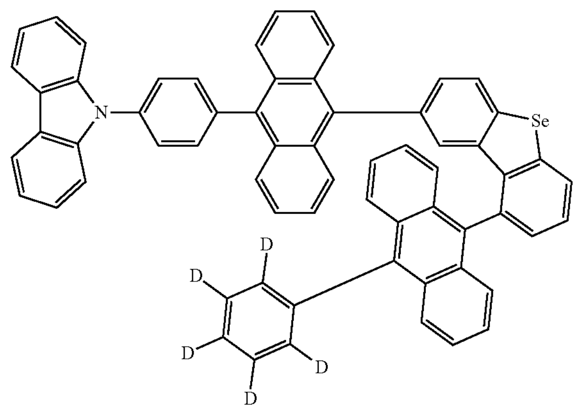
2075
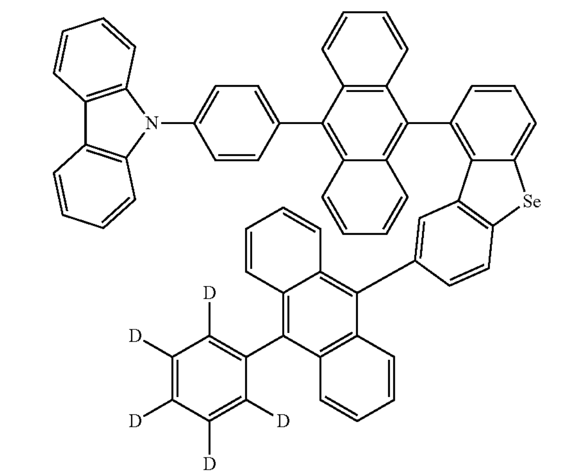
2076
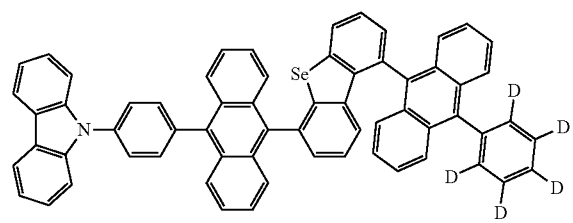

-continued
2077
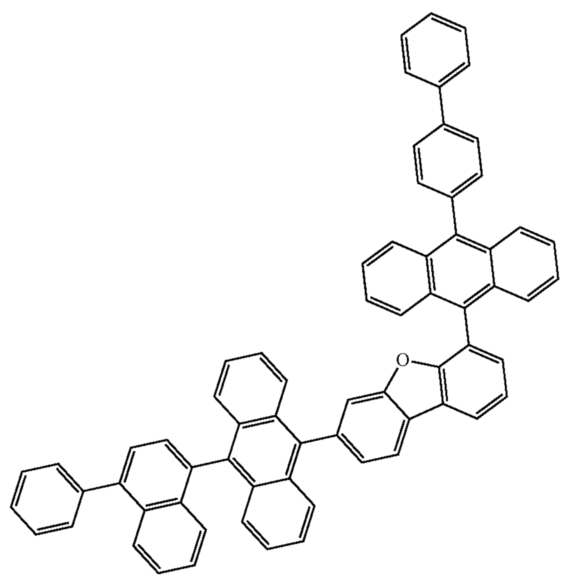
2078
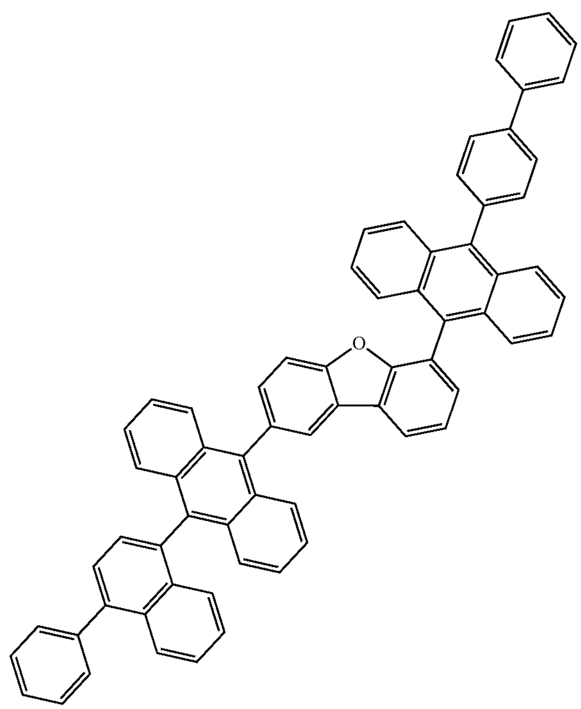
-continued
2079
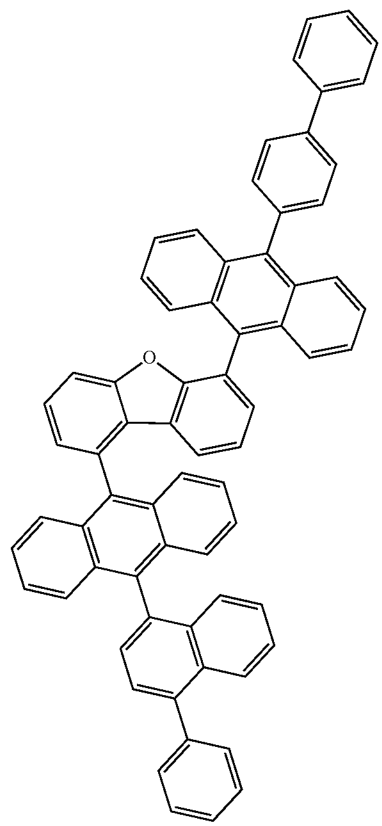
2080
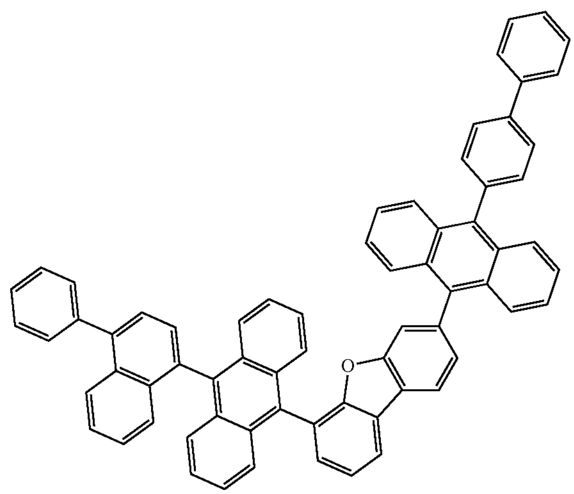

-continued
2081
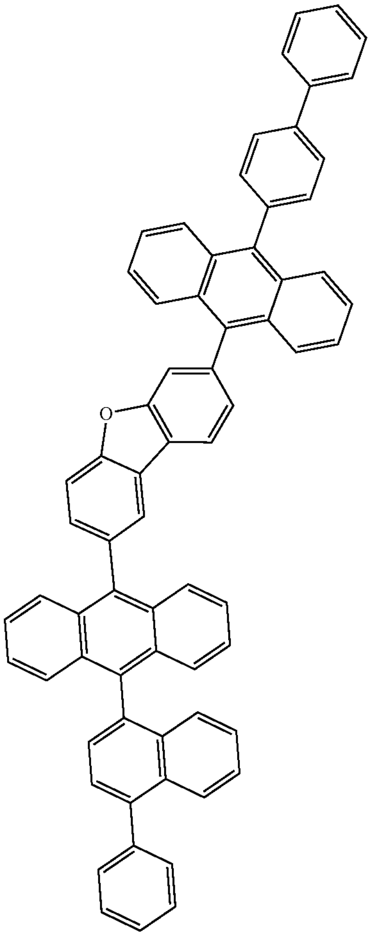
2082
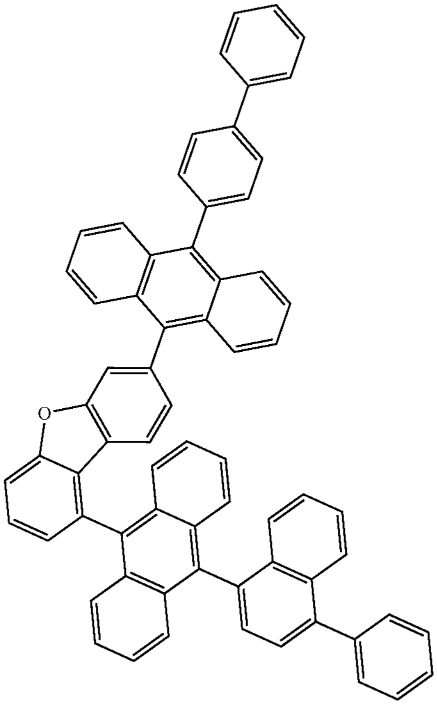
-continued
2083
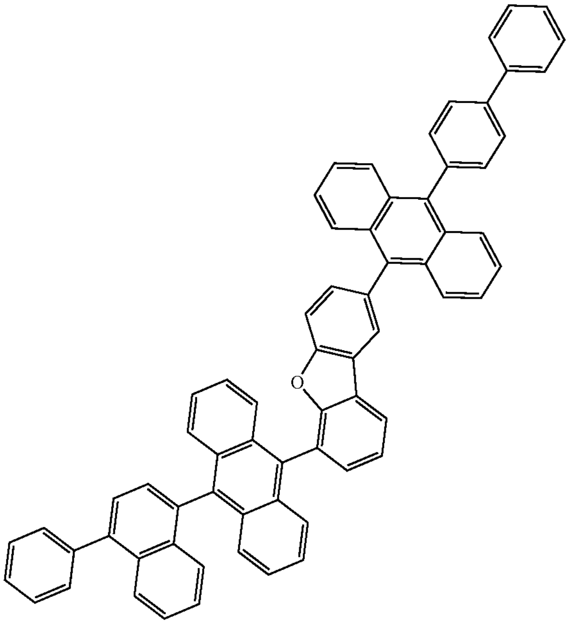
2084
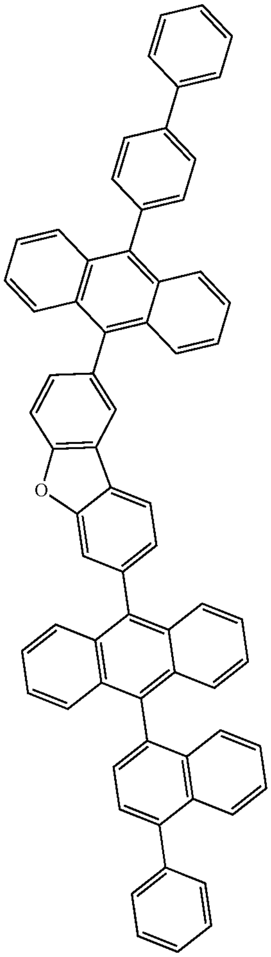

-continued
2085
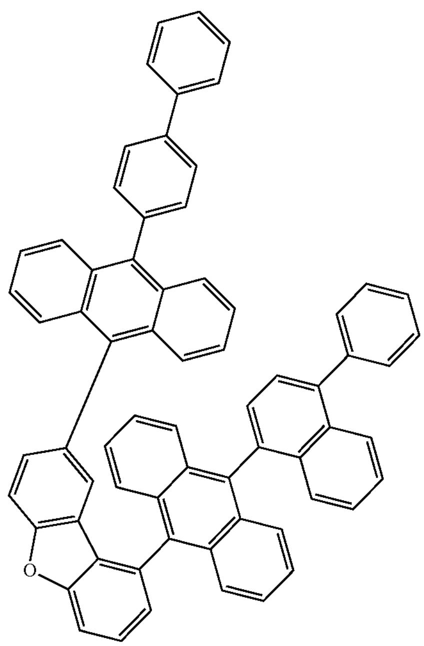
2086
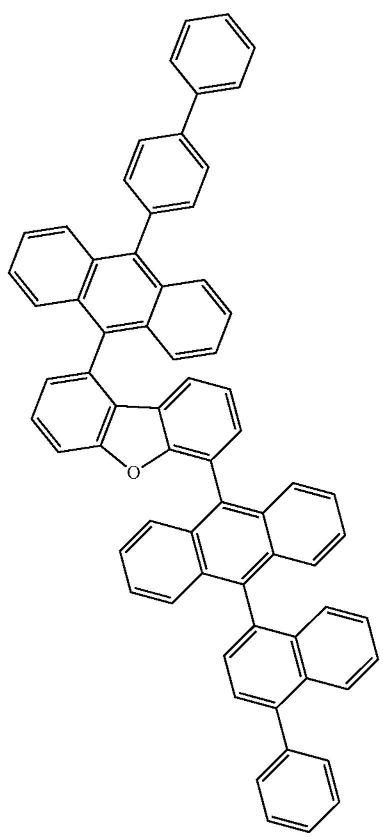
-continued
2087
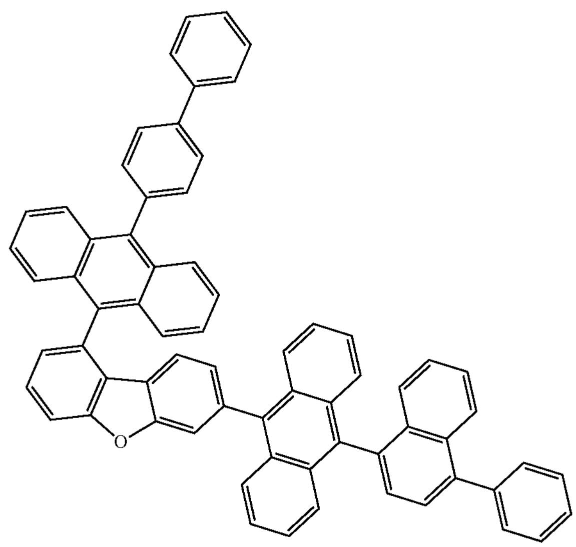
2088
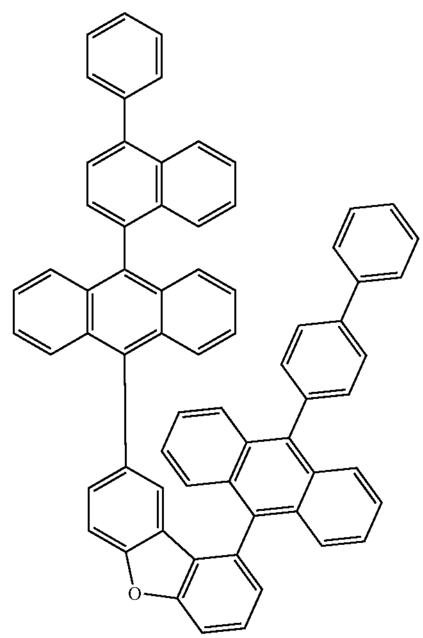

2089
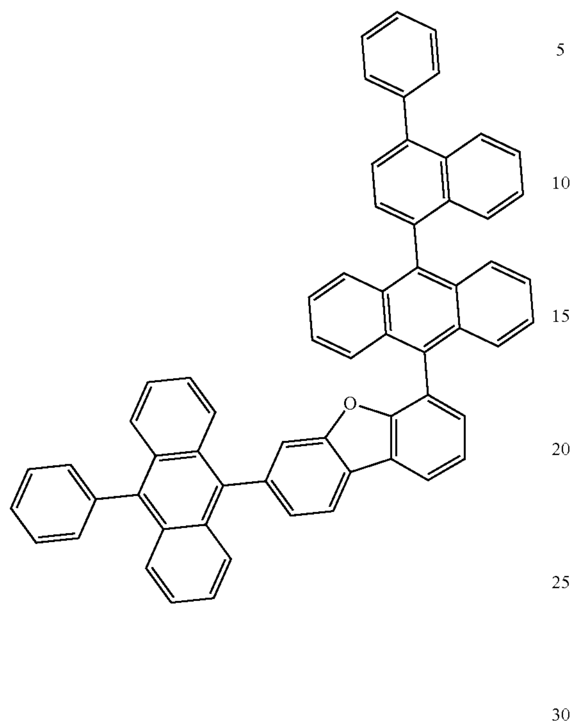
2090
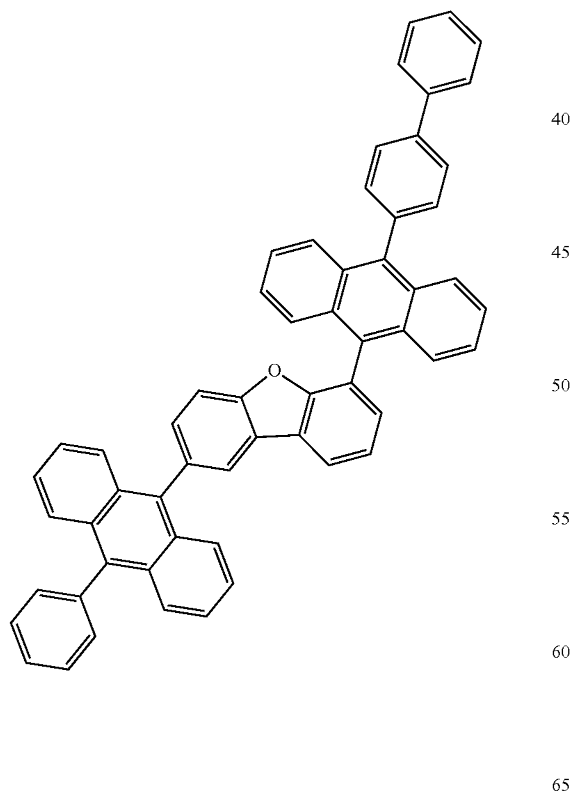
2091
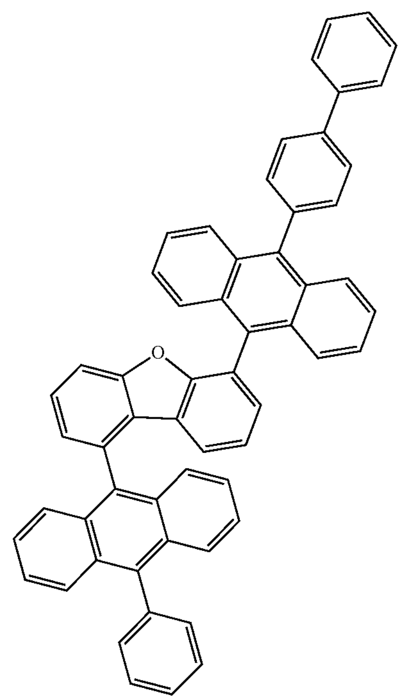
2092
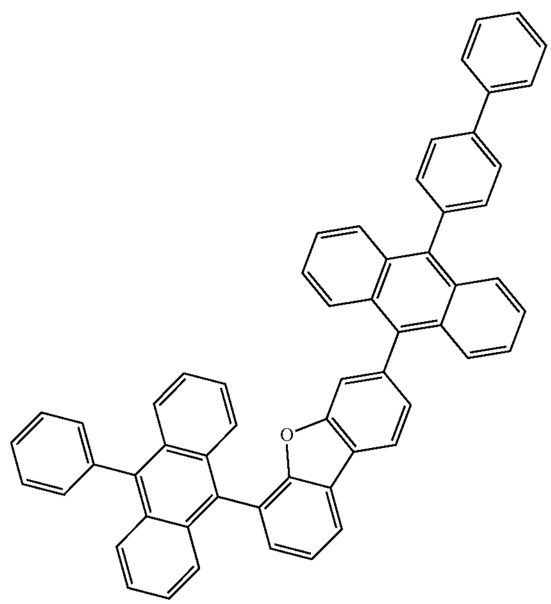

-continued
2093
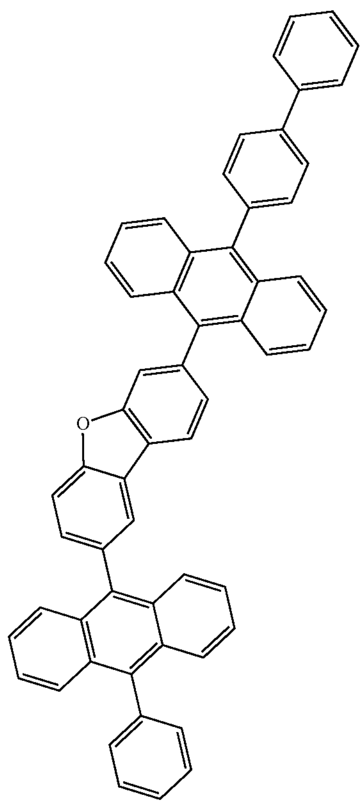
2094
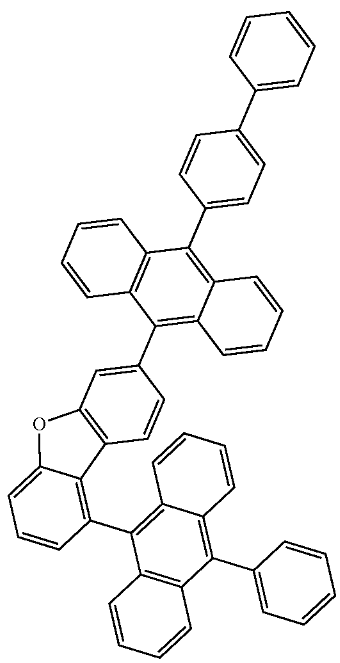
-continued
2095
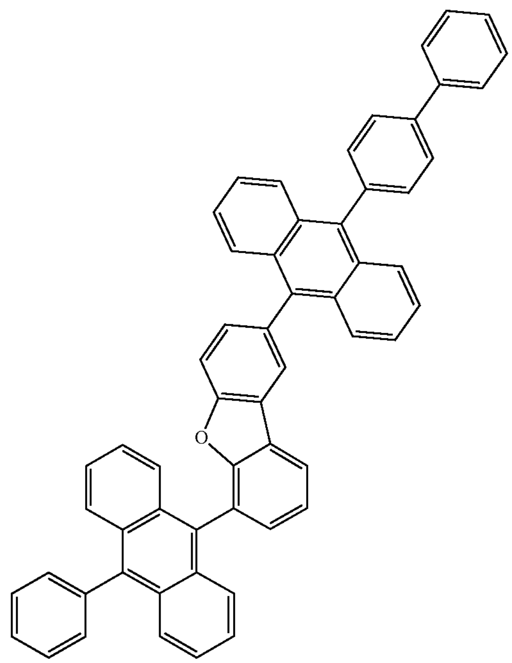
2096
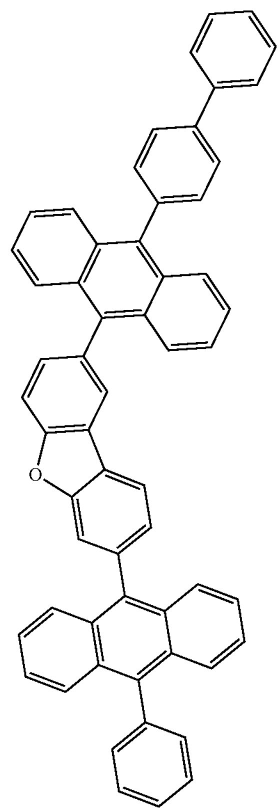

-continued
2097
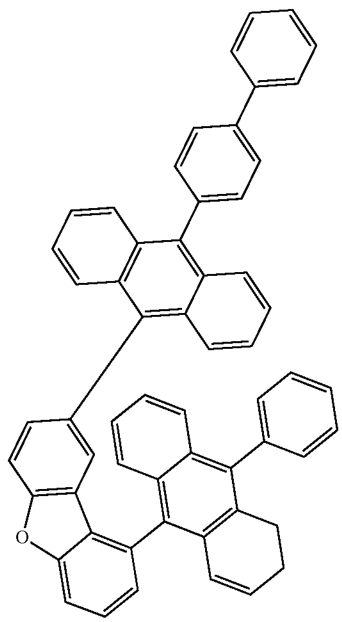
2098
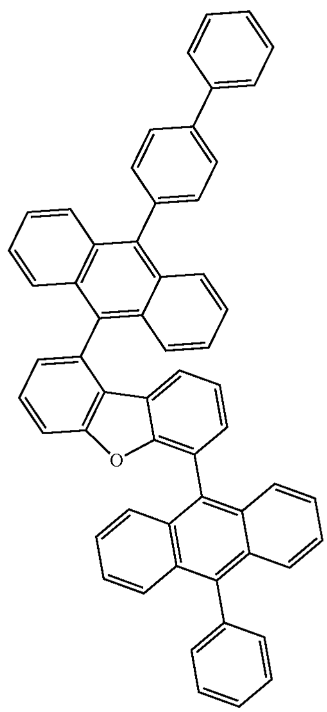
-continued
2099
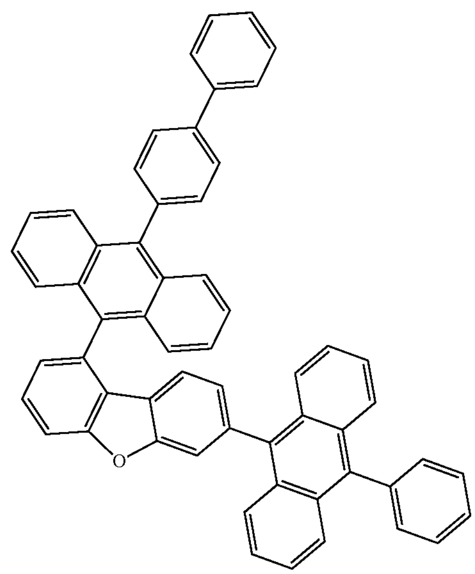
2100
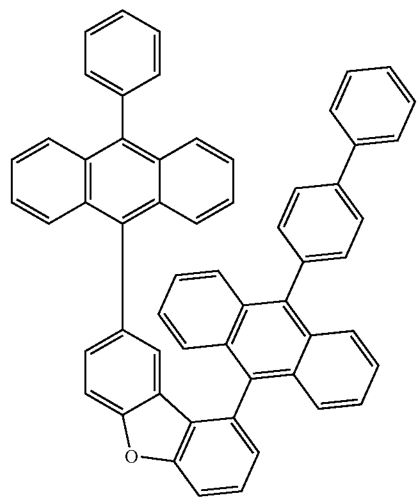
2101
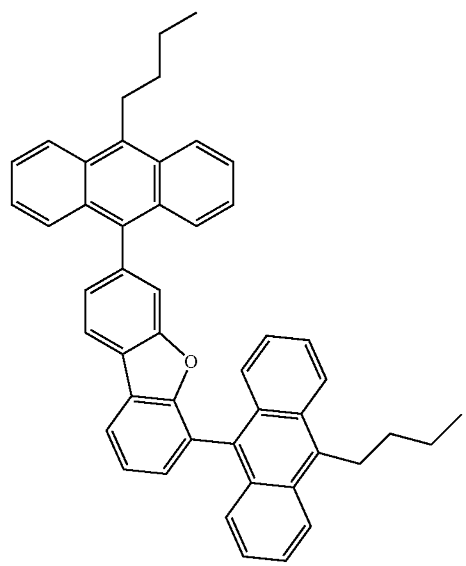

-continued
2102
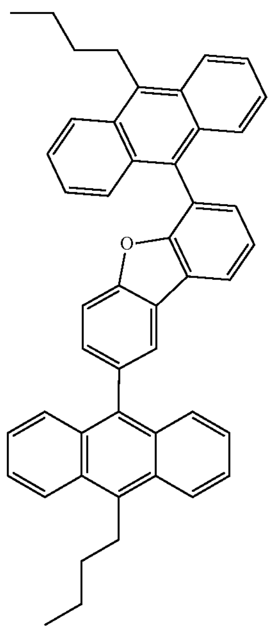
2103
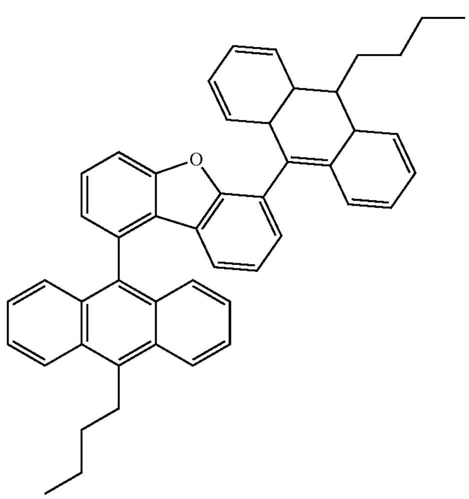
-continued
2104
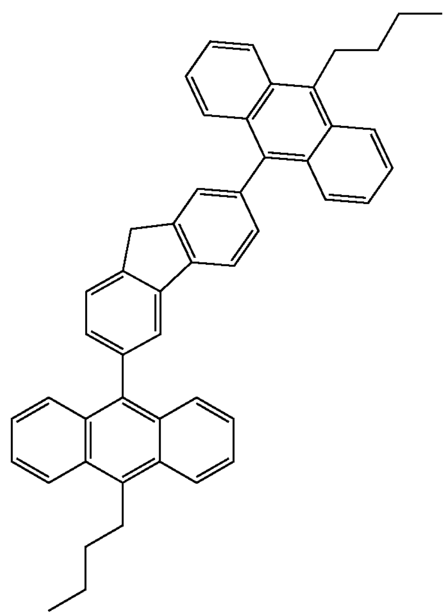
2105
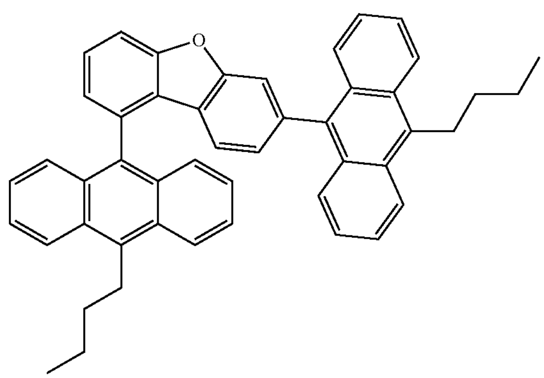
2106
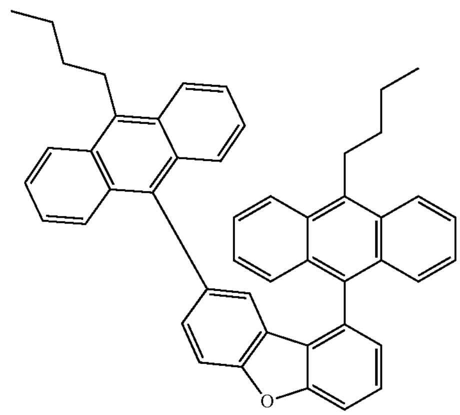

-continued
2107
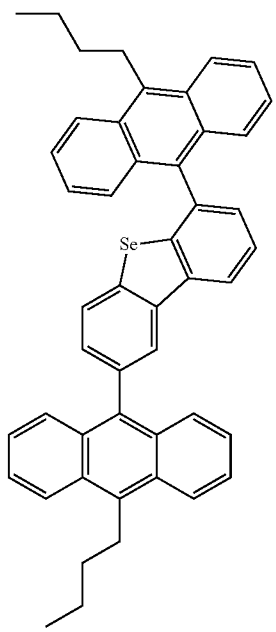
2108
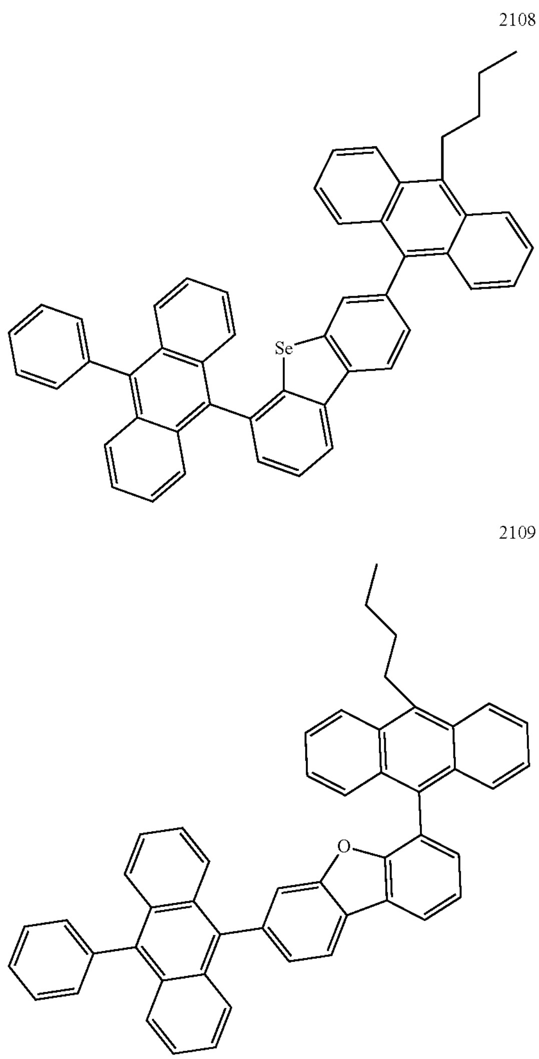
2109
-continued
2110
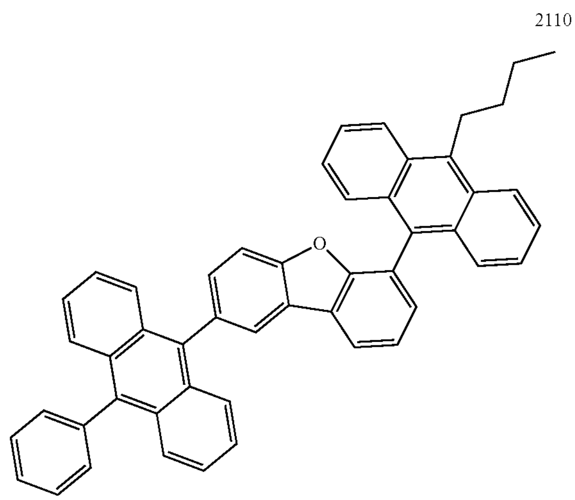
2111
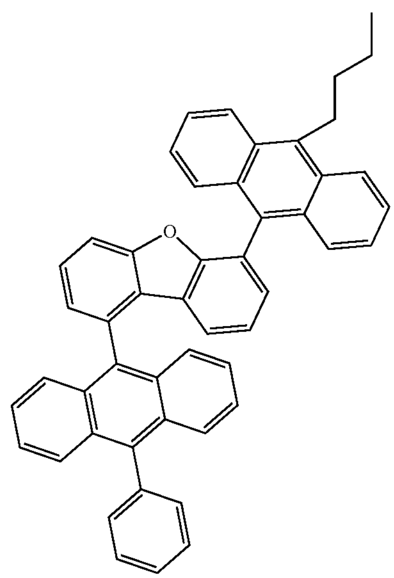
2112
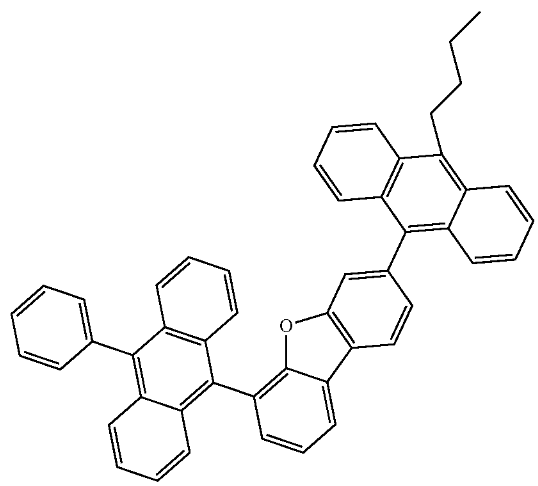

-continued
2113
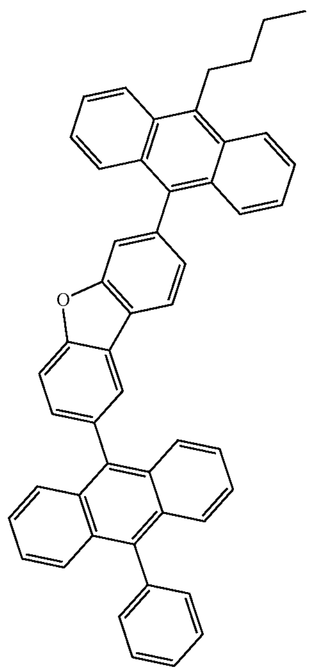
2114
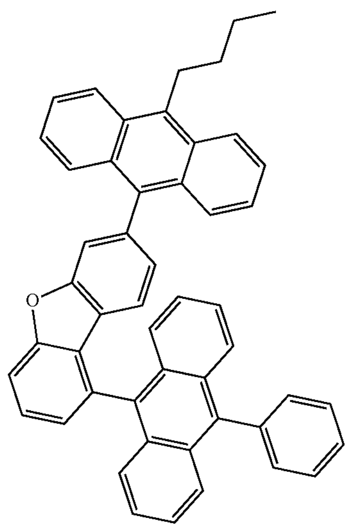
-continued
2115
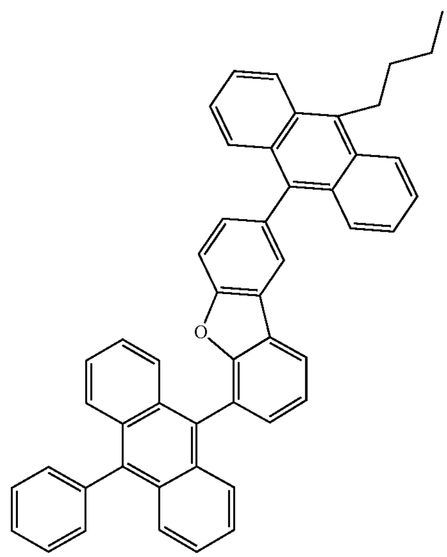
2116
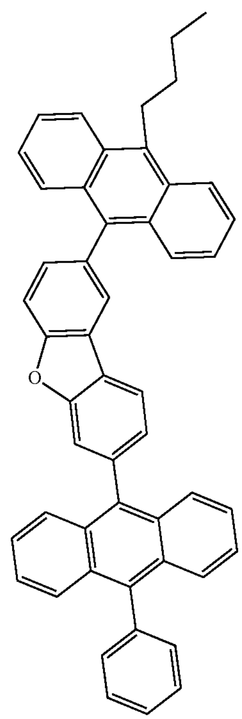

-continued

2117

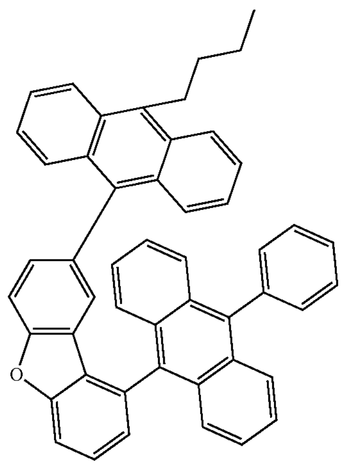

2118

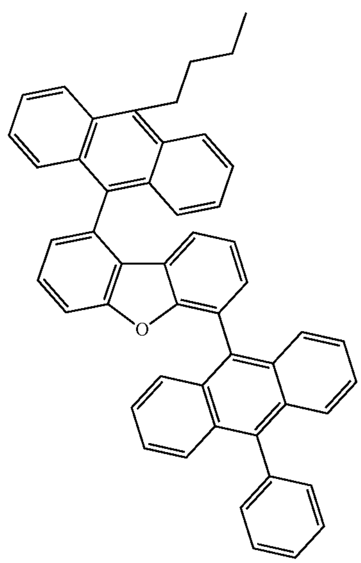

2119

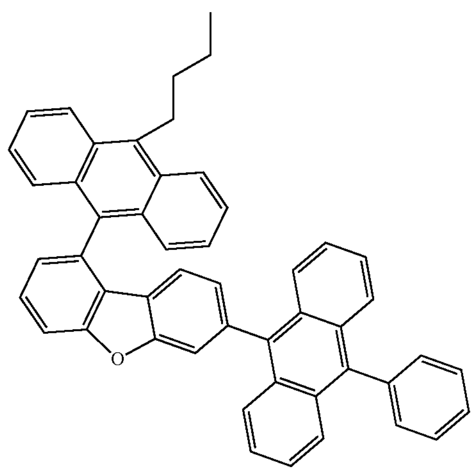

2120

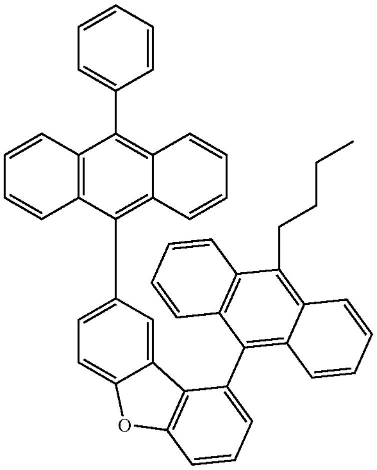

When the host is a mixture of the electron-transporting host and the hole-transporting host, a weight ratio of the electron-transporting host to the hole-transporting host may be in a range of about 1:9 to about 9:1, for example, about 2:8 to about 8:2, for example, about 4:6 to about 6:4, for example, about 5:5. When the weight ratio of the electron-transporting host to the hole-transporting host is within the ranges above, the hole-and-electron-transporting balance in the emission layer 15 may be achieved.

[Dopant in Emission Layer 15]

The dopant included in the emission layer 15 may include the heterocyclic compound.

[Sensitizer in Emission Layer 15]

In an embodiment, the sensitizer included in the emission layer 15 may include a phosphorescent sensitizer including at least one metal a first-row transition metal, a second-row transition metal, a third-row transition metal, or a combination thereof, of the Periodic Table of Elements.

In one or more embodiments, the sensitizer may include an organic ligand $L_1$ and at least one metal M11 of a first-row transition metal, a second-row transition metal, a third-row transition metal of the Periodic Table of Elements, wherein $L_1$ and M11 may form 1, 2, 3, or 4 cyclometallated rings.

In one or more embodiments, the sensitizer may include an organometallic compound represented by Formula 103:

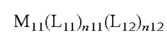

$M_{11}(L_{11})_{n11}(L_{12})_{n12}$ Formula 103 wherein, in Formula 103, $M_{11}$ may be a first-row transition metal, a second-row transition metal, or a third-row transition metal of the Periodic Table of Elements, $L_{11}$ may be a ligand represented by one of Formulae 1-1 to 1-4, $L_{12}$ may be a monodentate ligand or a bidentate ligand, n11 may be 1, and n12 may be 0, 1, or 2, 1-1

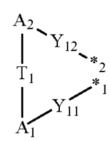

-continued 1-2

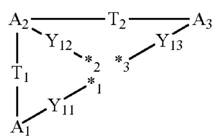

1-3

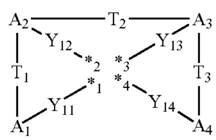

1-4

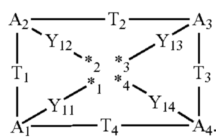

In Formulae 1-1 to 1-4, $A_1$ to $A_4$ may each independently be a substituted or unsubstituted $C_5$-$C_{30}$ carbocyclic group, a substituted or unsubstituted $C_1$-$C_{33}$ heterocyclic group, or a non-cyclic group, $Y_{11}$ to $Y_{14}$ may each independently be a chemical bond, O, S, $N(R_{91})$, $B(R_{91})$, $P(R_{91})$, or $C(R_{91})(R_{92})$, $T_1$ to $T_4$ may each independently be a single bond, a double bond, *—$N(R_{93})$—*', *—O—*', *—C(=Q)-*', *—S(=O)—*', *—$S(=O)_2$—*', *—$C(R_{93})$=*', *=$C(R_{93})$—*', *—$C(R_{93})$=$C(R_{94})$—*', *—C(=S)—*', or *—C≡C—*', a substituent of the substituted $C_5$-$C_{30}$ carbocyclic group, a substituent of substituted $C_1$-$C_{30}$ heterocyclic group, and $R_{91}$ to $R_{94}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent aromatic condensed polycyclic group, a substituted or unsubstituted monovalent aromatic condensed heteropolycyclic group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$Ge(Q_1)(Q_2)(Q_3)$, —$C(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, wherein each of a substituent of the substituted $C_5$-$C_{30}$ carbocyclic group and a substituent of substituted $C_1$-$C_{30}$ heterocyclic group may not be hydrogen, $*_1$, $*_2$, $*_3$, and $*_4$ each indicate a binding site to $M_{11}$, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent aromatic condensed polycyclic group, a monovalent aromatic condensed heteropolycyclic group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof.

In one or more embodiments, the sensitizer may be a compound of Groups I to X, but embodiments of the present disclosure are not limited thereto:

Group I

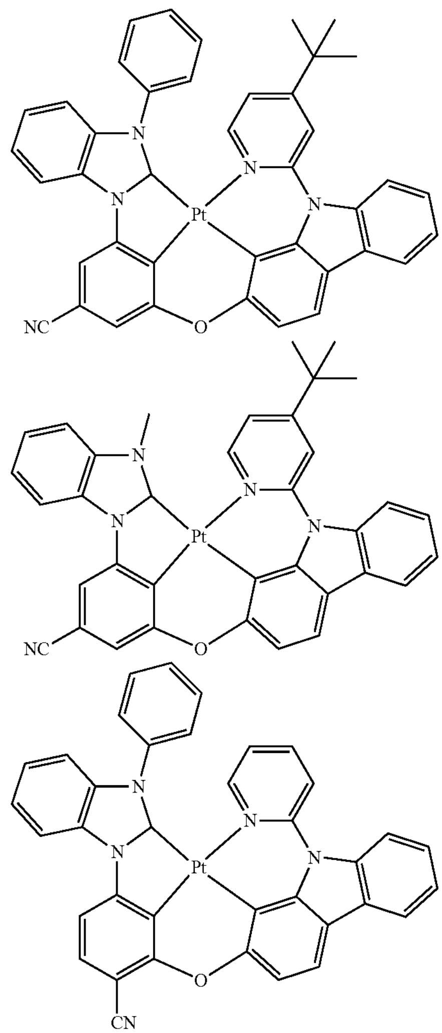

-continued
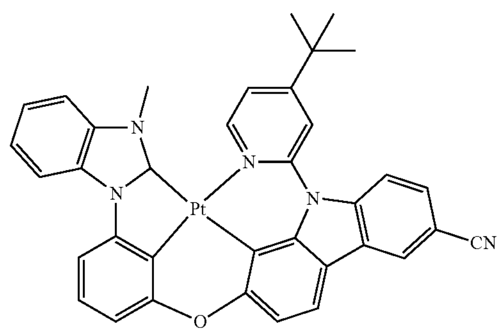
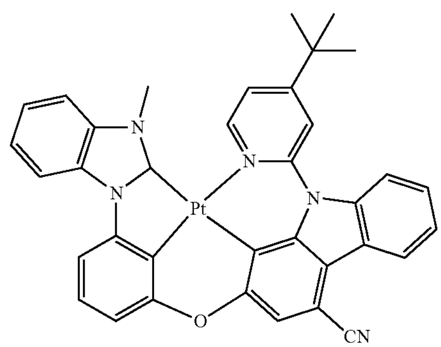
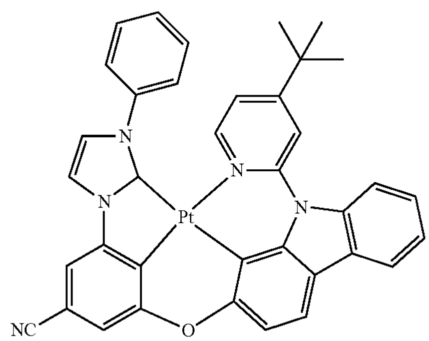
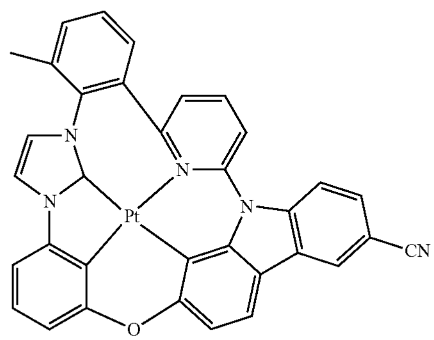
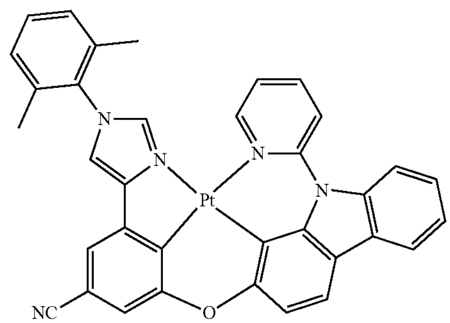
-continued
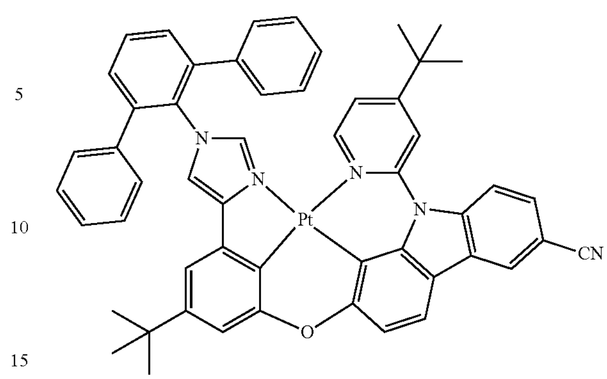
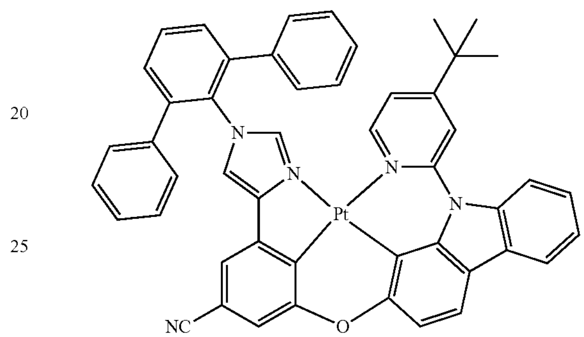
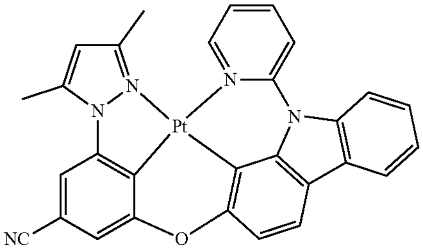
Group II
1
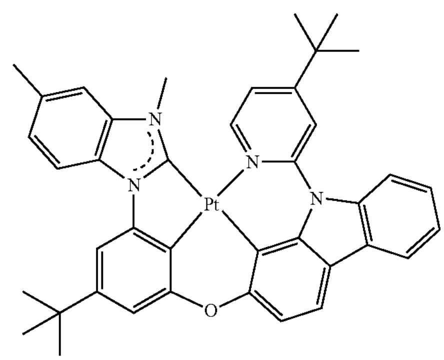

-continued
2
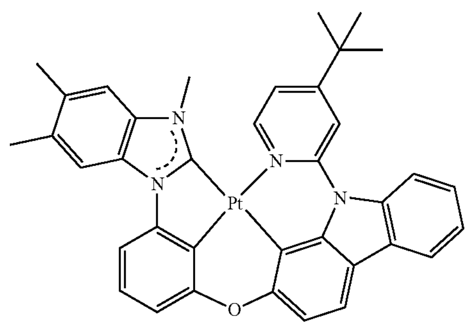
3
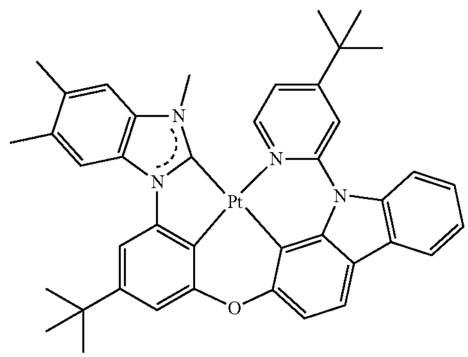
4
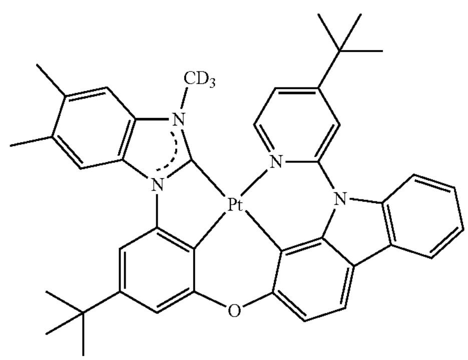
5
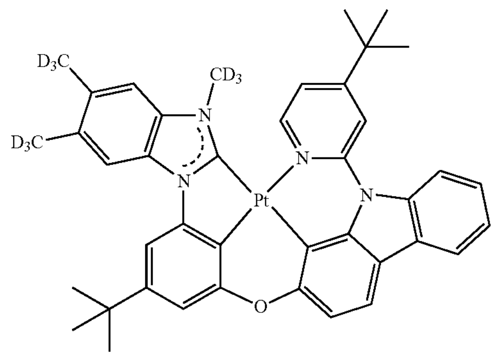
-continued
6
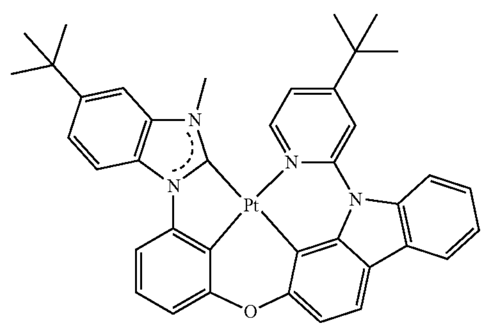
7
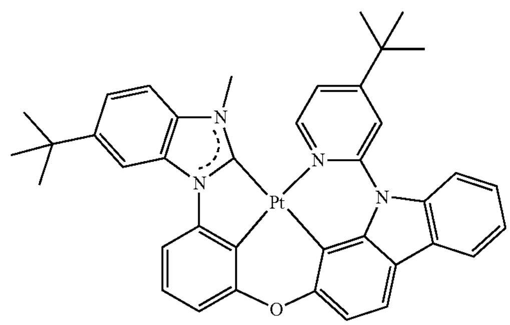
8
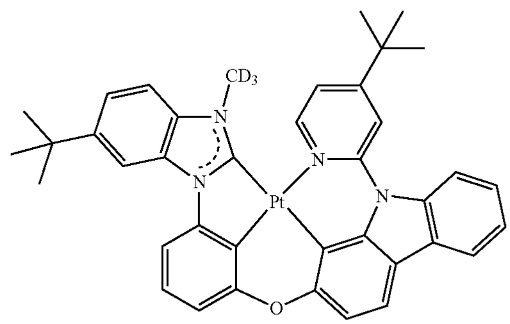
9
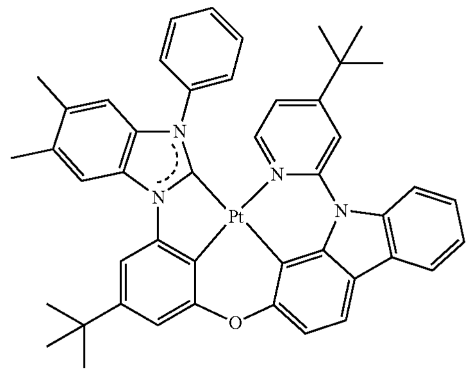

-continued
10
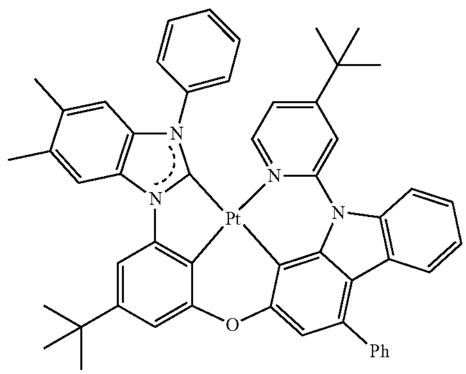
11
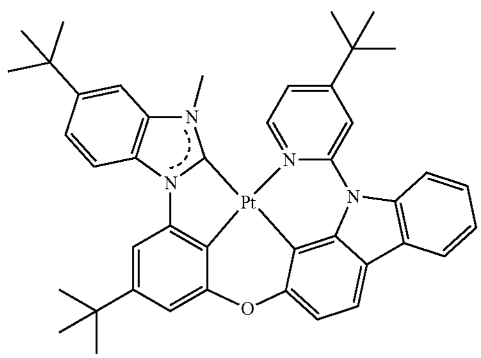
12
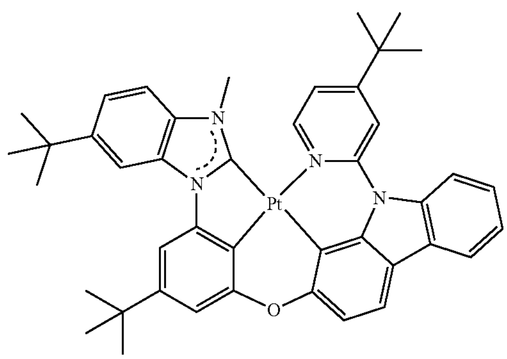
13
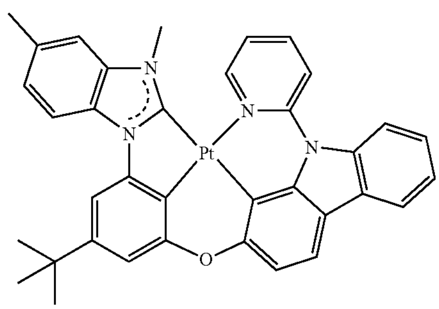
-continued
14
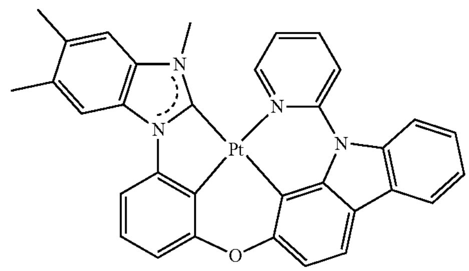
15
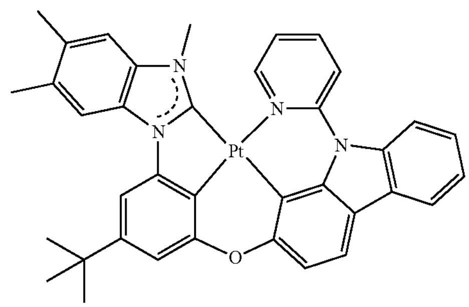
16
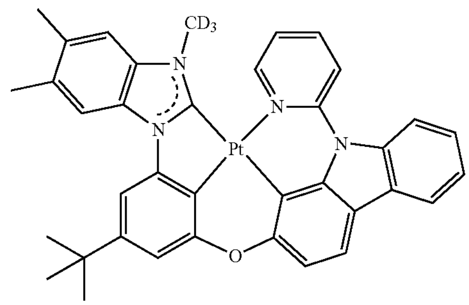
17
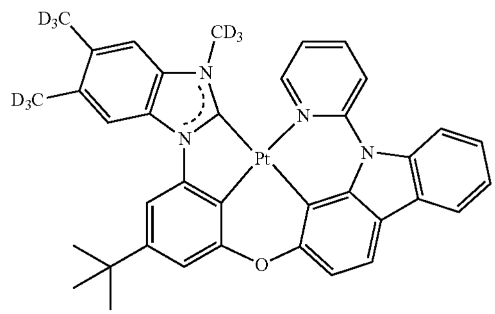
18
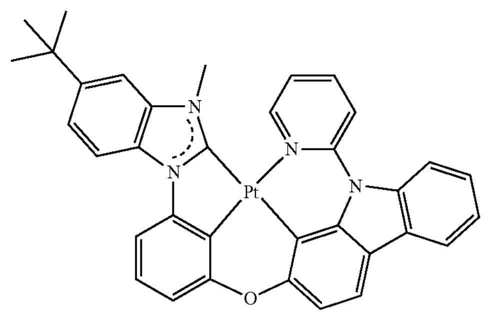

-continued
19
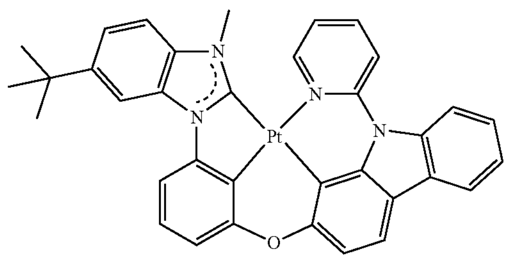
20
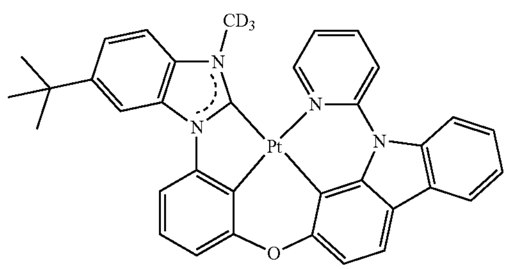
21
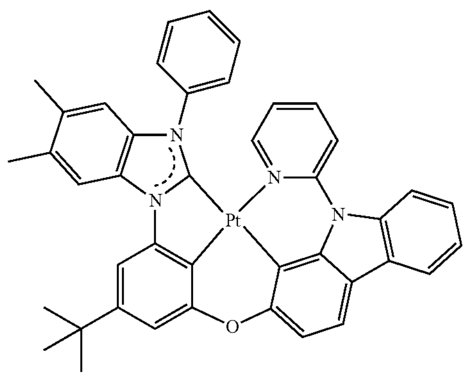
22
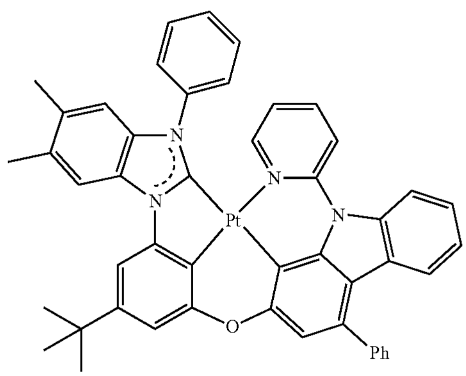
-continued
23
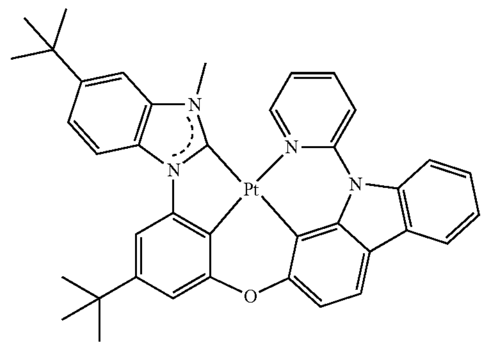
24
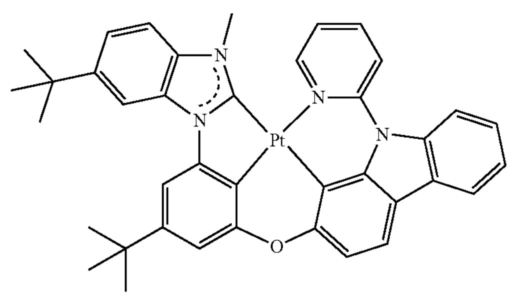
25
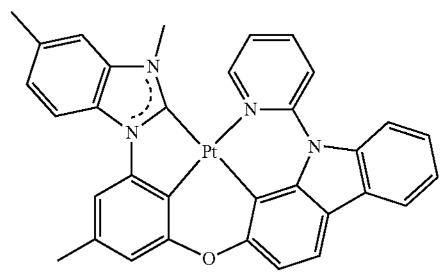
26
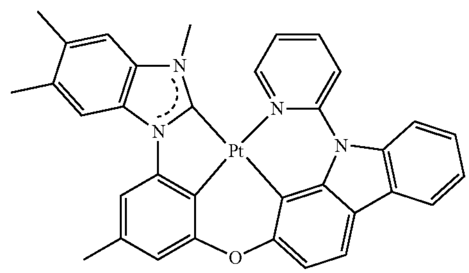
27
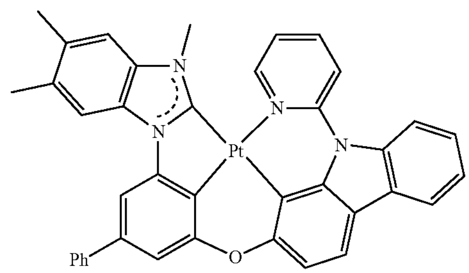

-continued
28
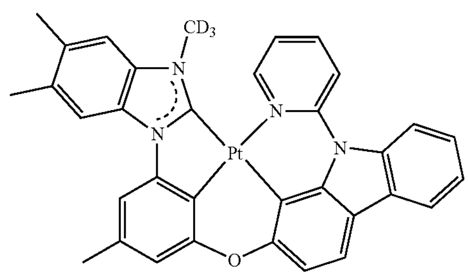
29
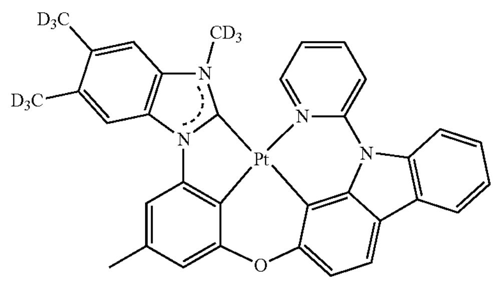
30
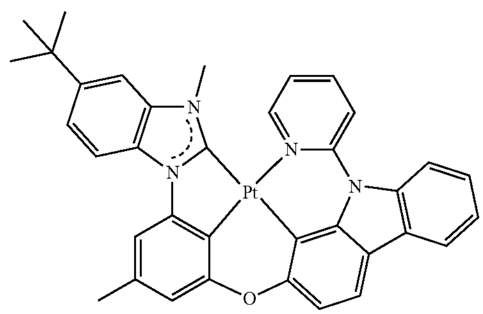
31
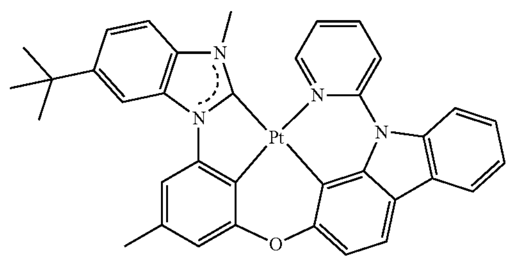
32
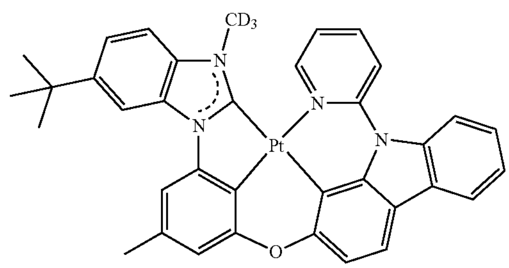
-continued
33
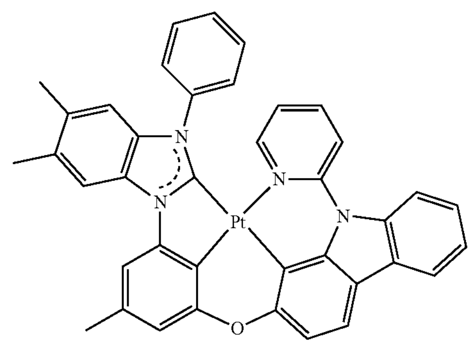
34
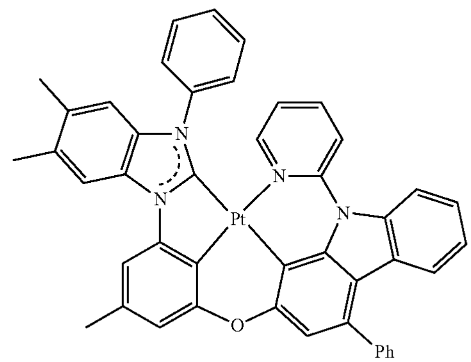
35
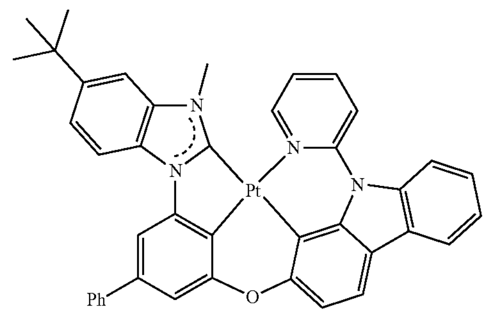
36
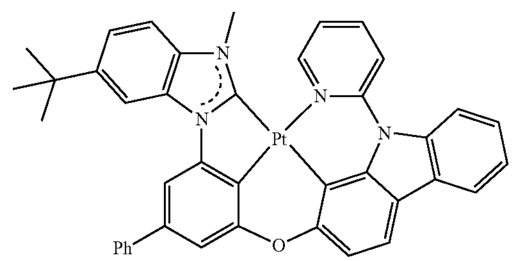
37
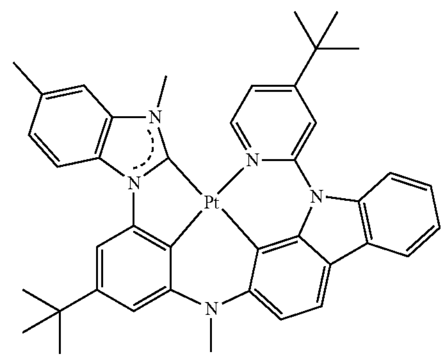

-continued
38
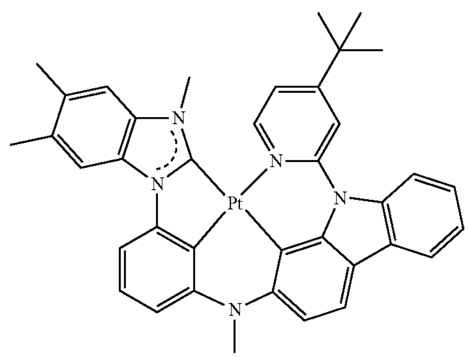
39
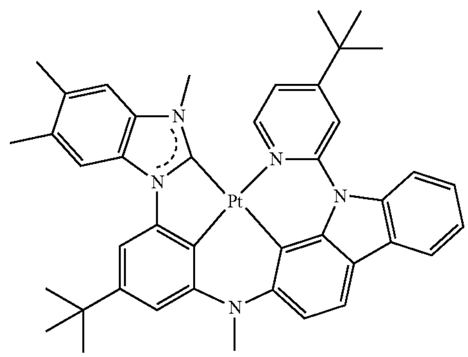
40
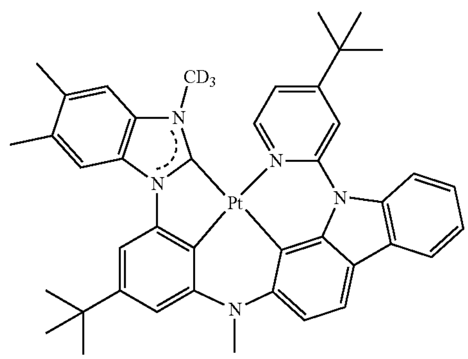
41
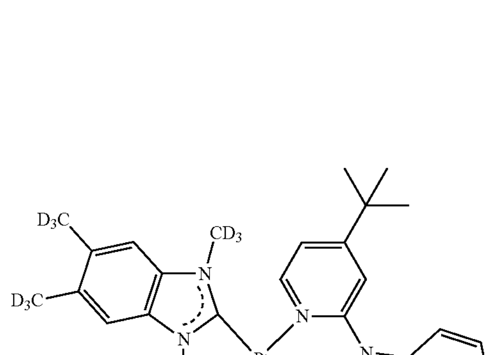
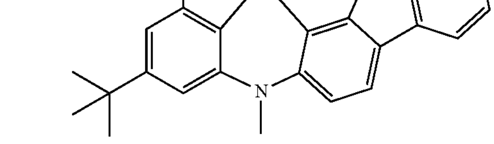
-continued
42
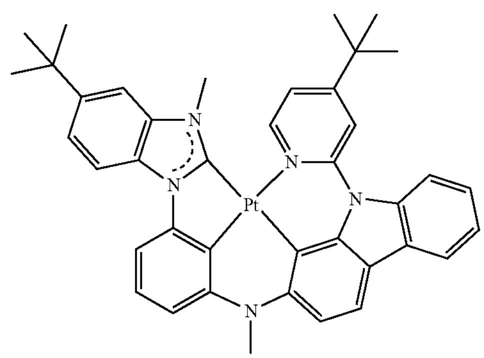
43
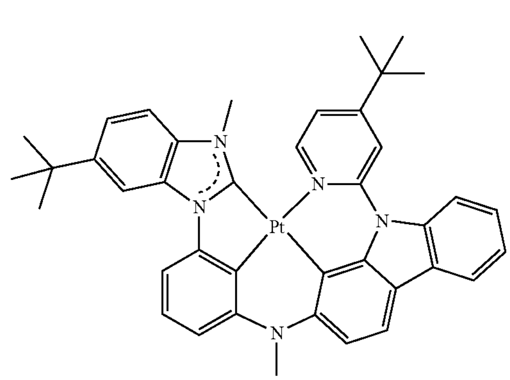
44
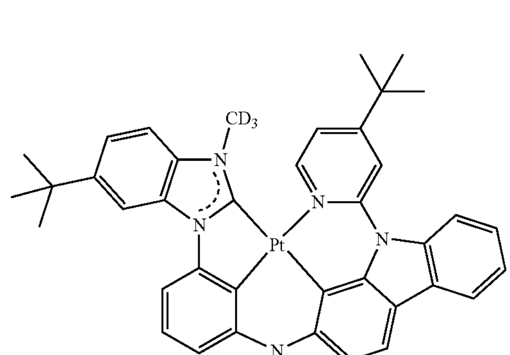
45
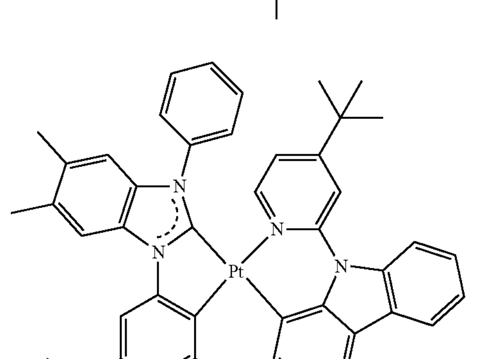
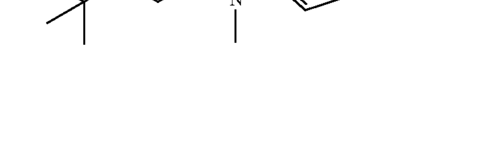

-continued
46
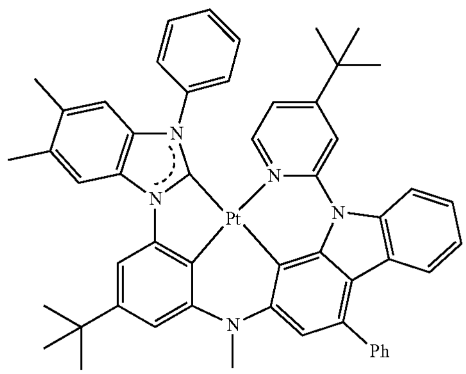
47
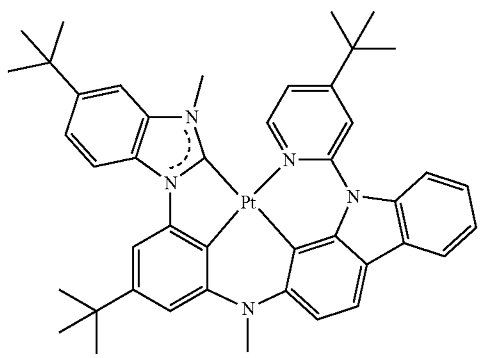
48
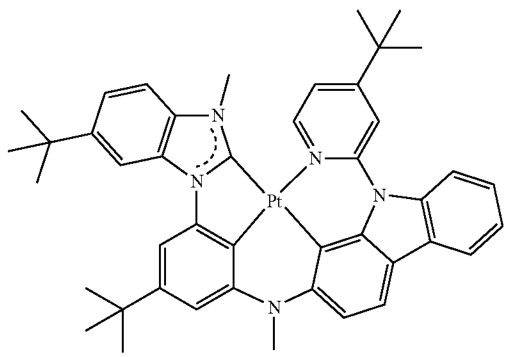
49
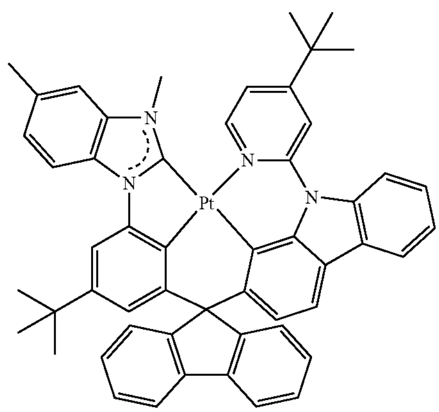
-continued
50
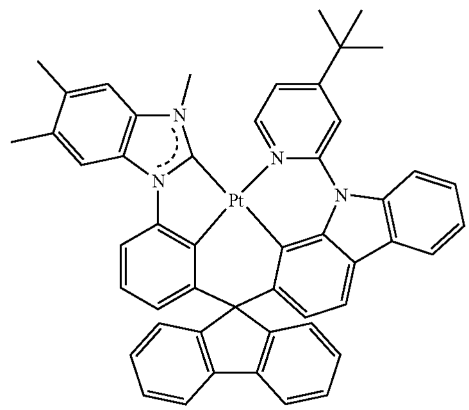
51
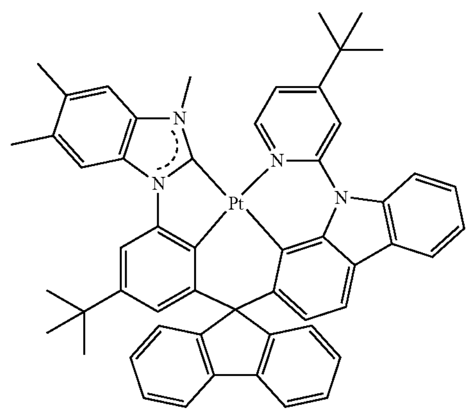
52
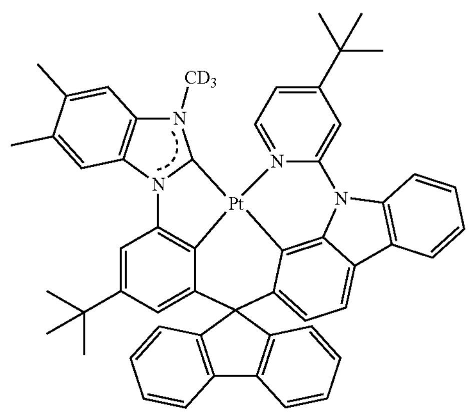
53
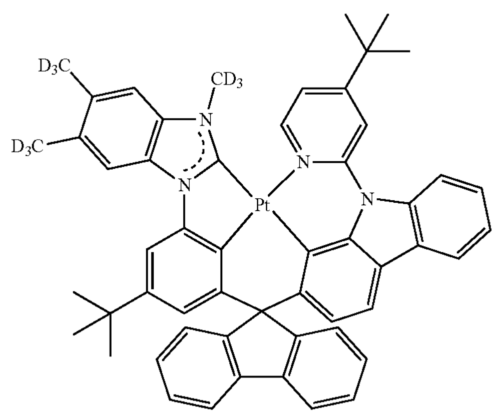

-continued
54
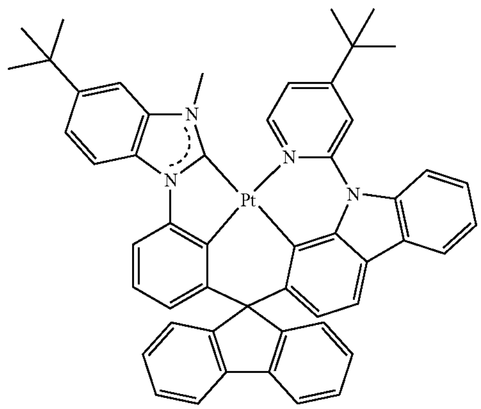
55
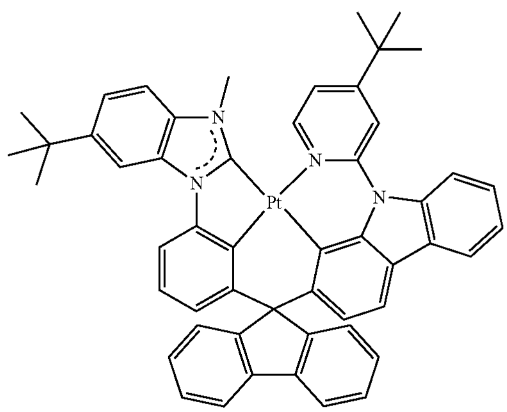
56
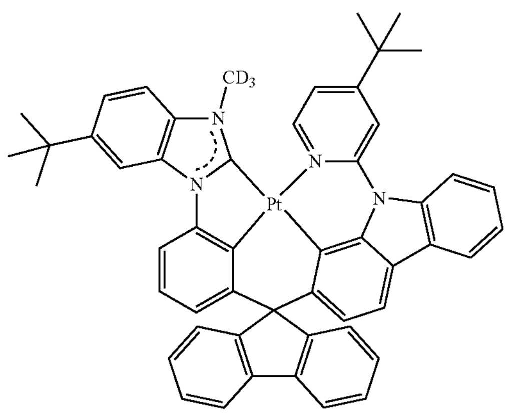
-continued
57
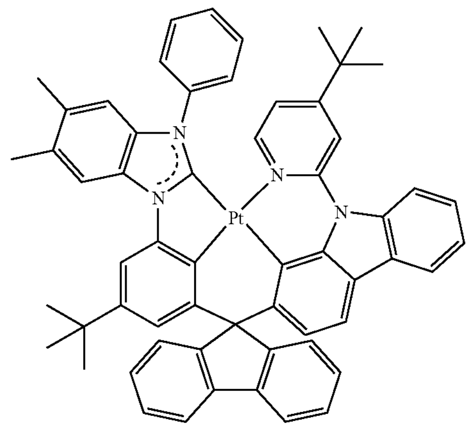
58
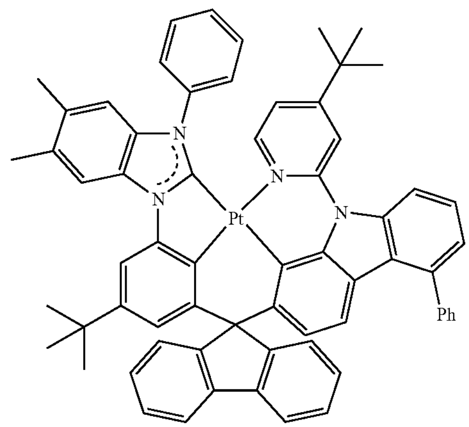
59
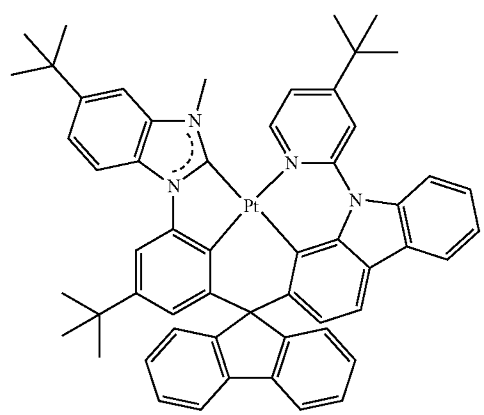

-continued
60
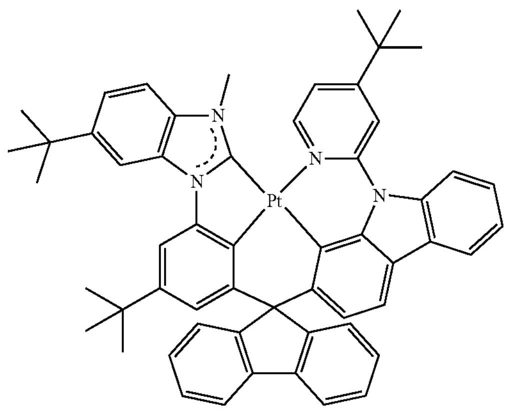
61
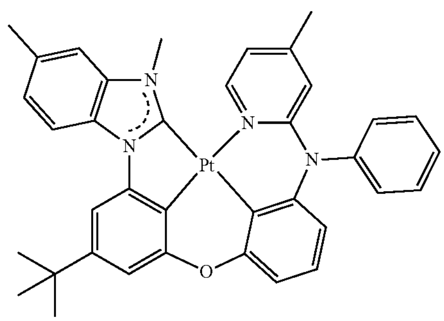
62
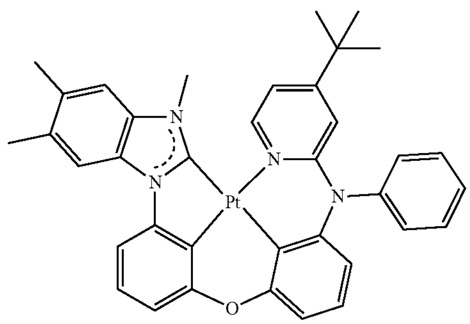
63
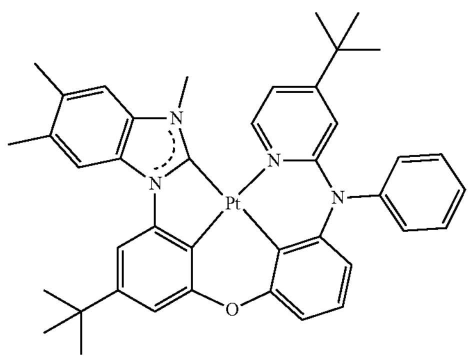
-continued
64
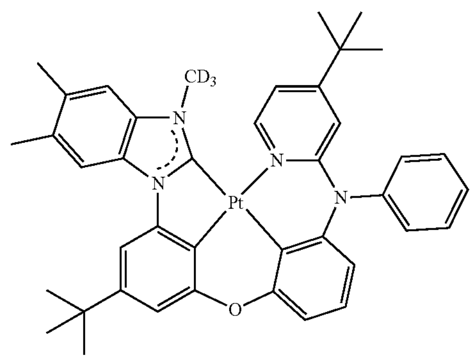
65
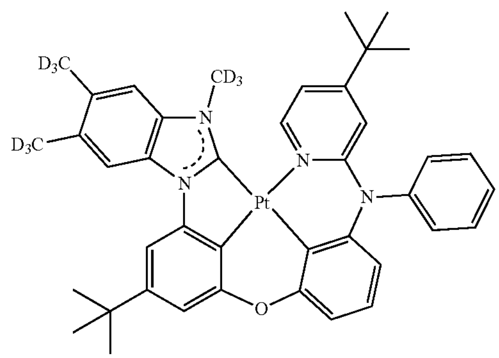
66
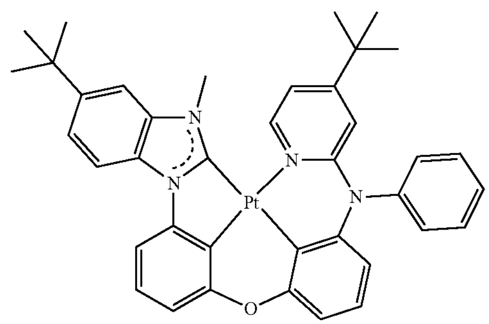
67
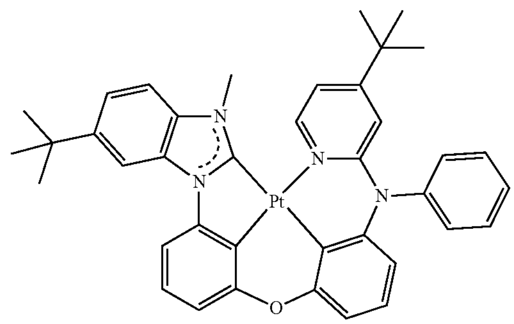

68
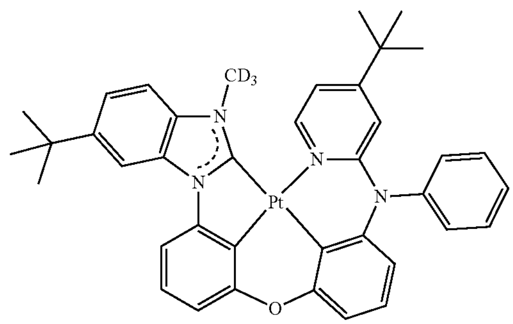
69
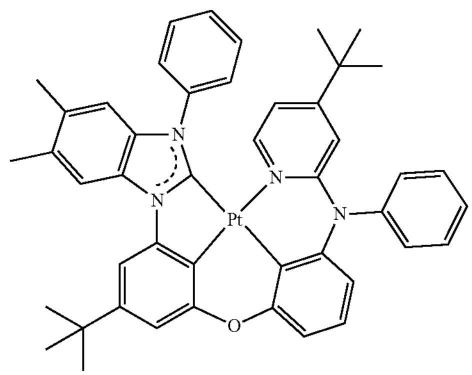
70
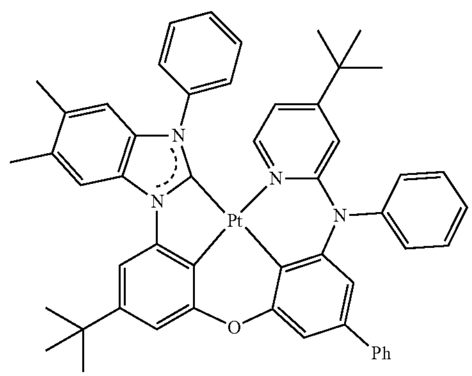
71
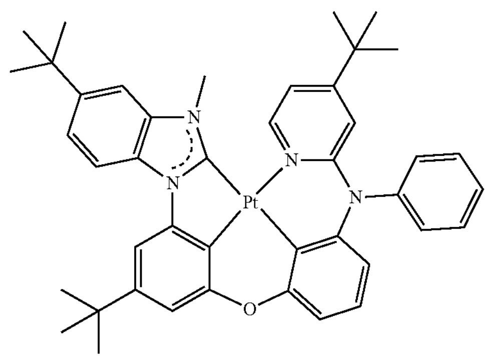
72
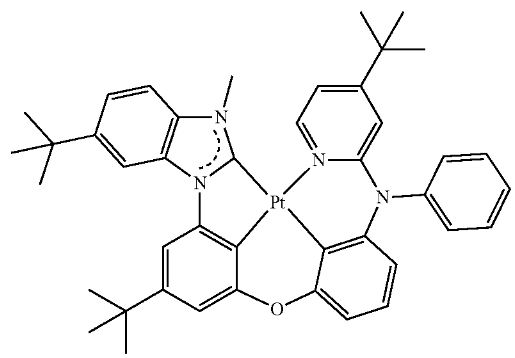
73
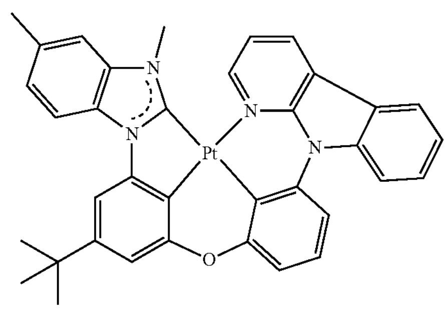
74
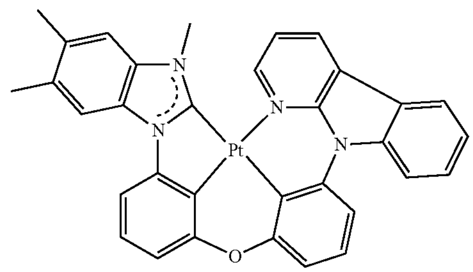
75
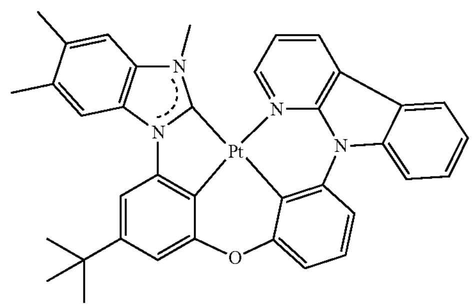
76
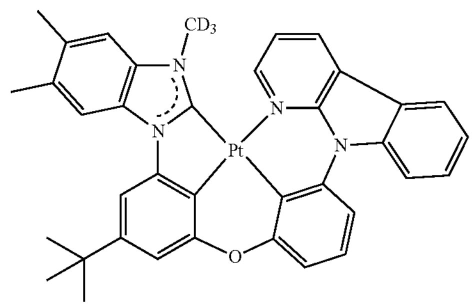

-continued
77
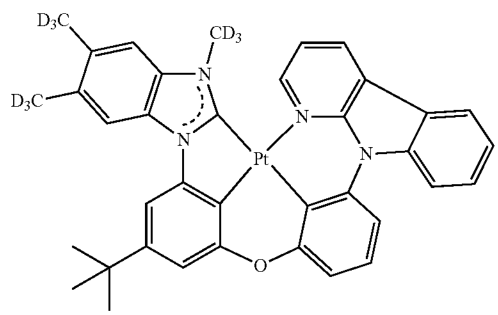
78
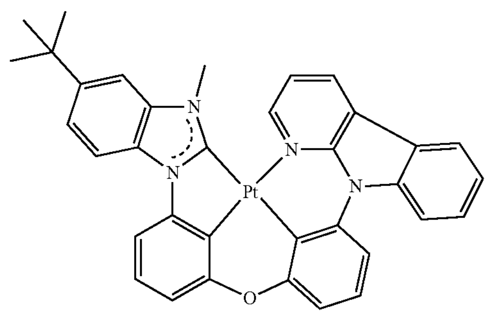
79
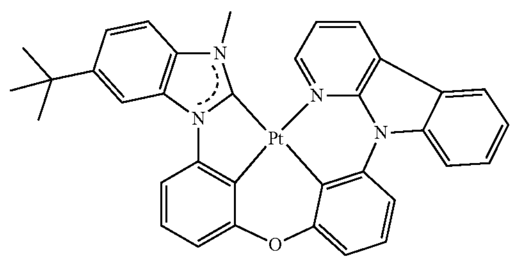
89
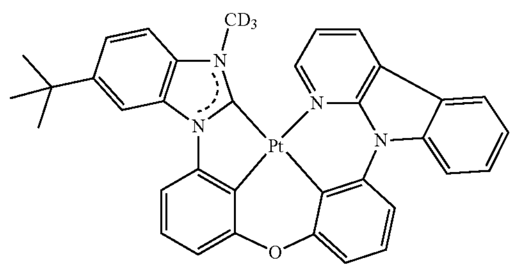
81
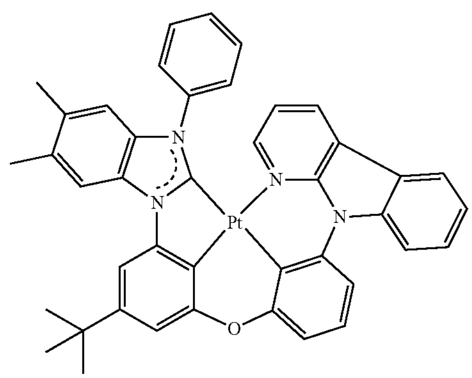
-continued
82
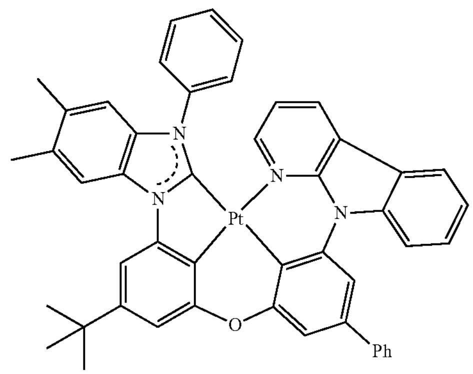
83
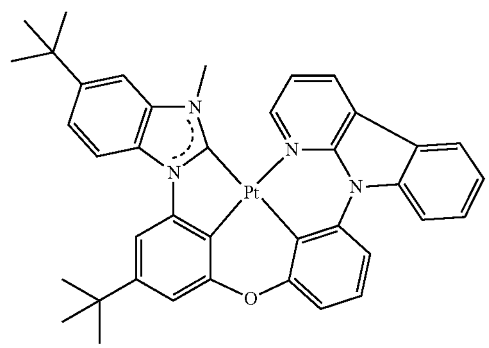
84
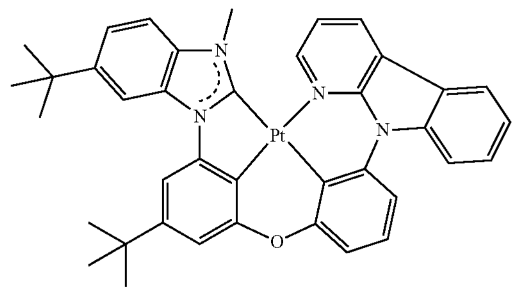
85
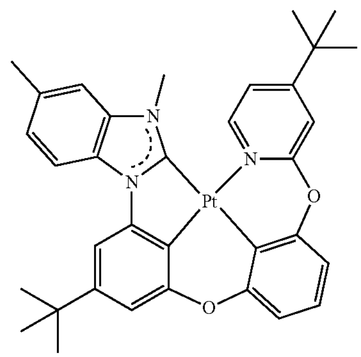

-continued
86
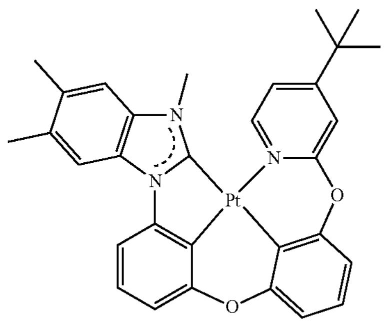
87
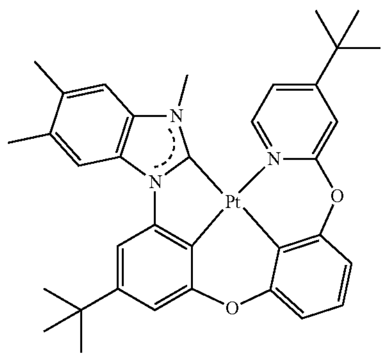
88
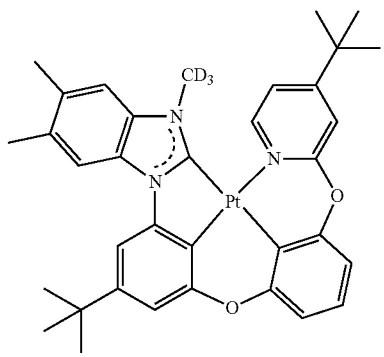
89
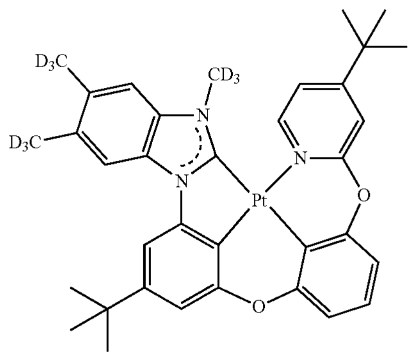
-continued
90
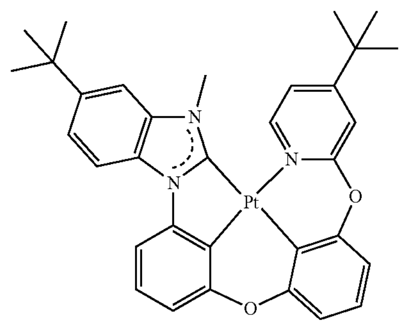
91
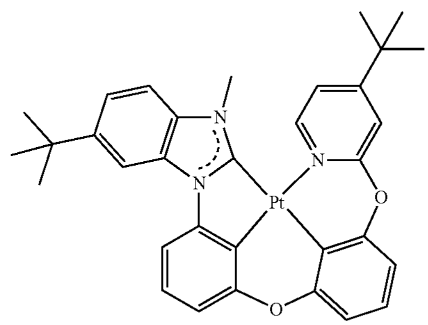
92
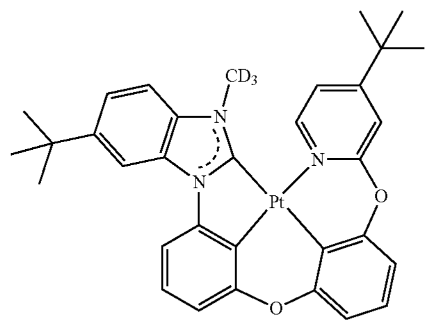
93
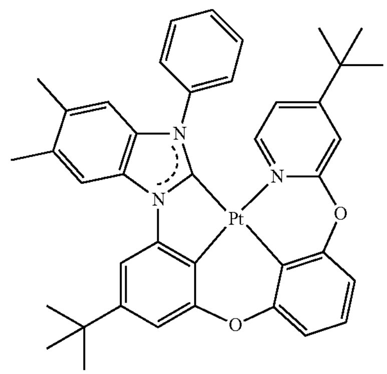

-continued
94
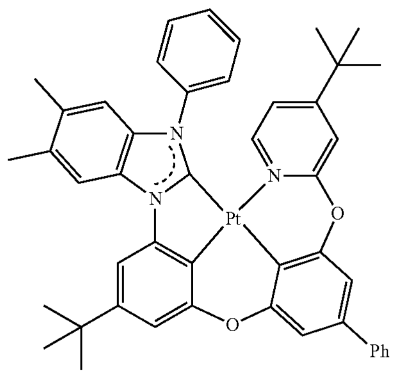
95
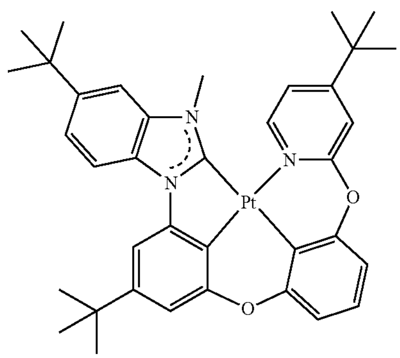
96
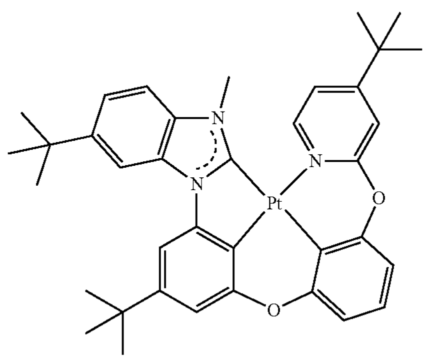
97
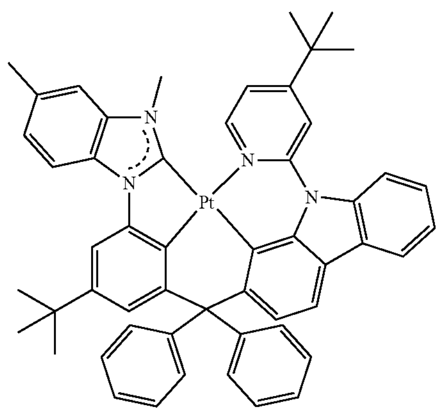
-continued
98
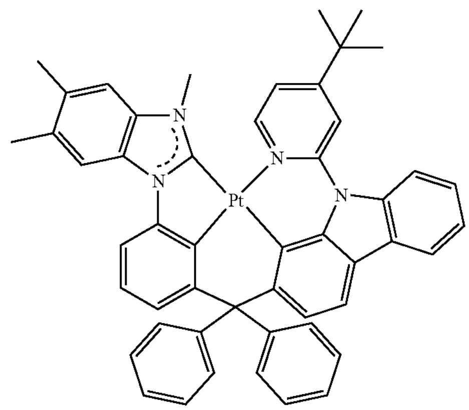
99
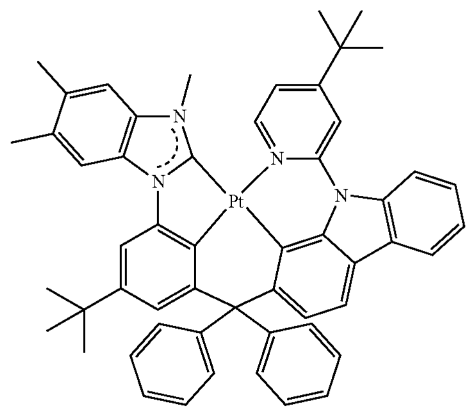
100
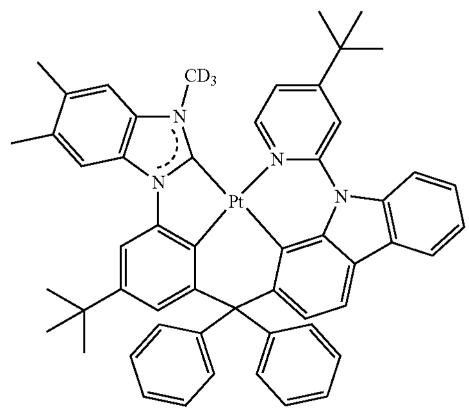
101
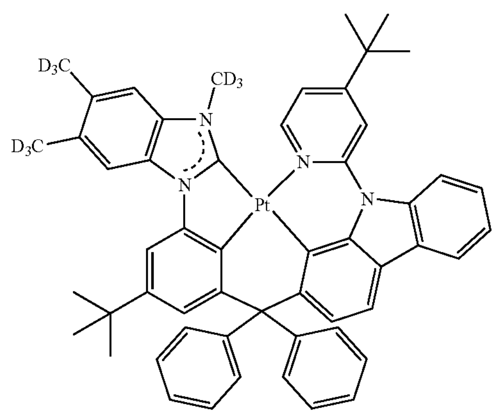

-continued
102
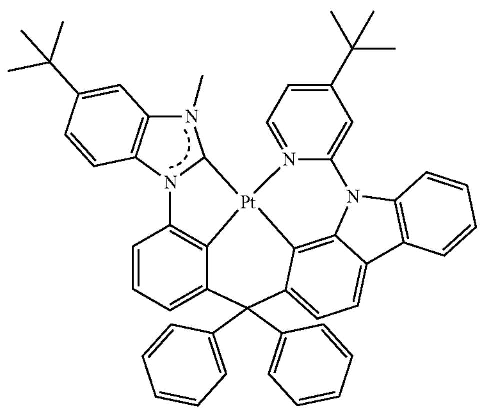
103
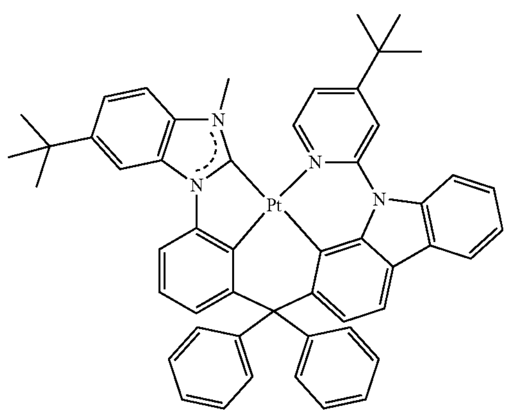
104
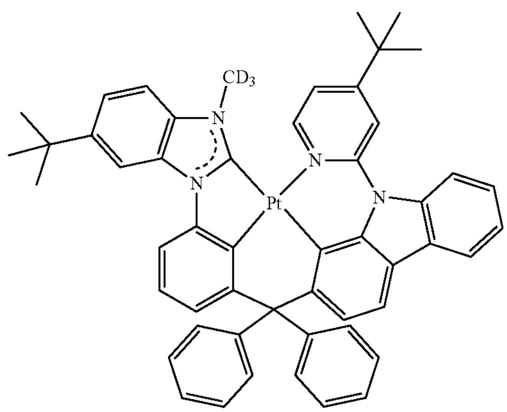
-continued
105
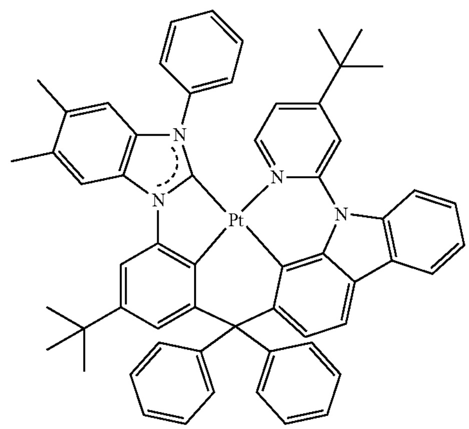
106
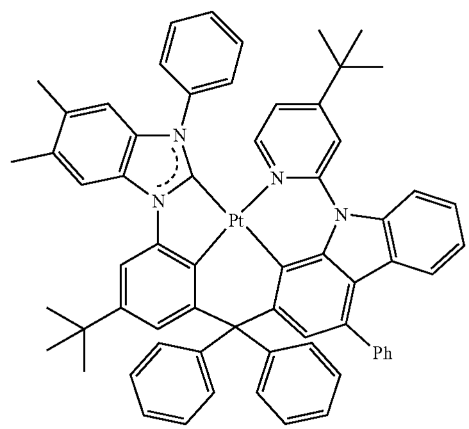
107
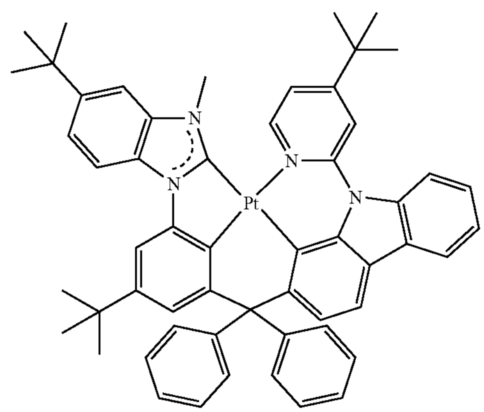

-continued
108
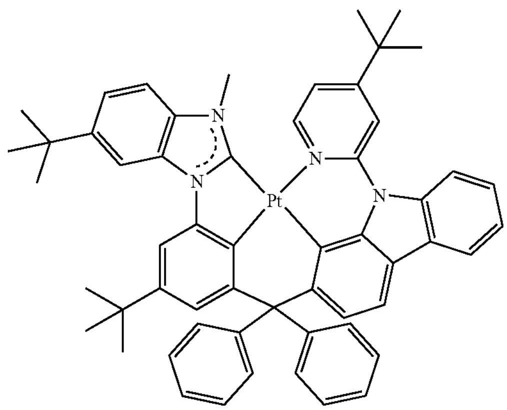
109
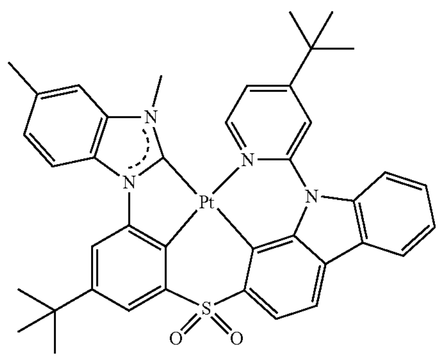
110
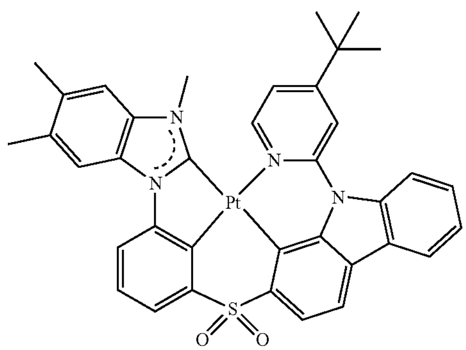
111
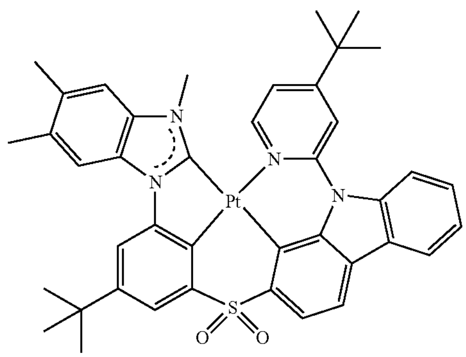
-continued
112
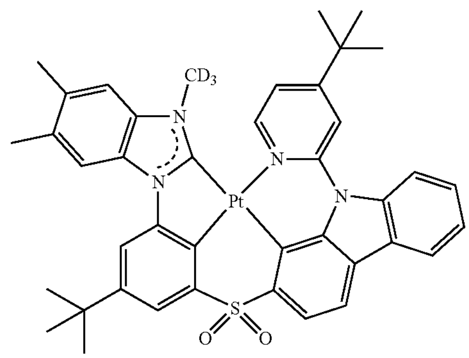
113
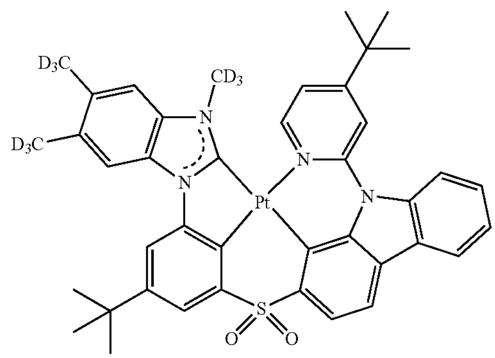
114
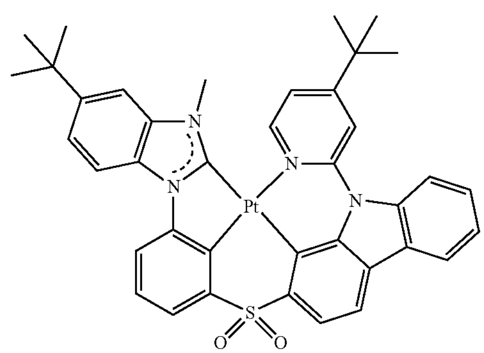
115
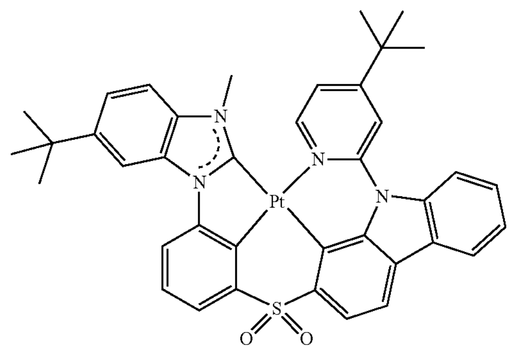

-continued
116
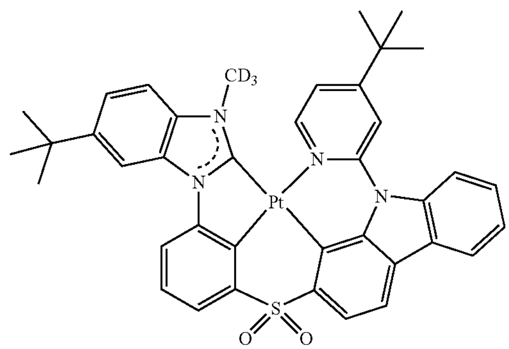
117
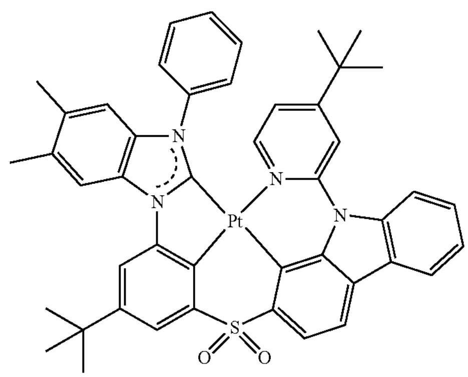
118
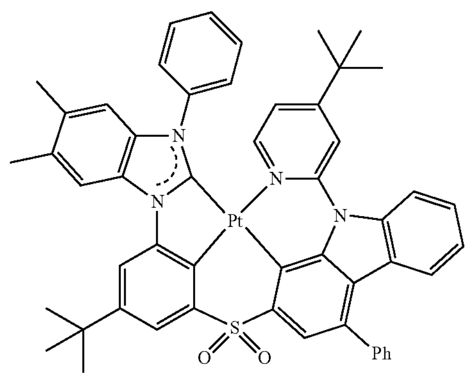
119
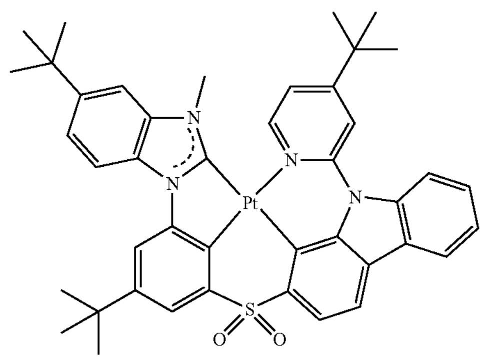
-continued
120
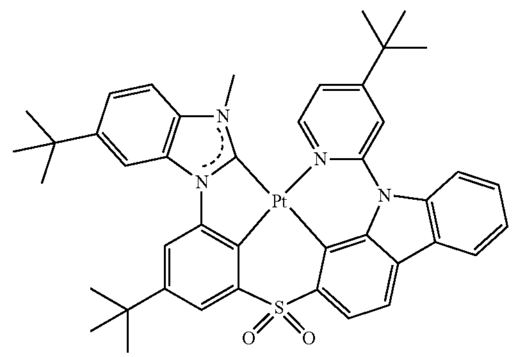
Group III
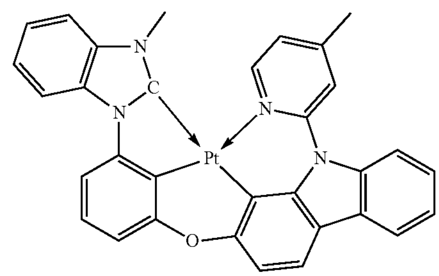
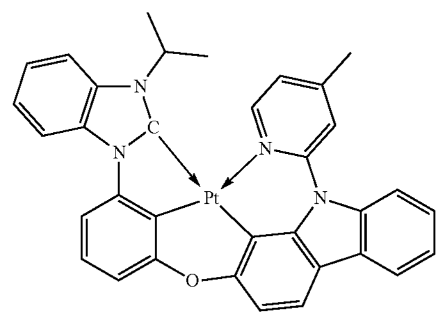
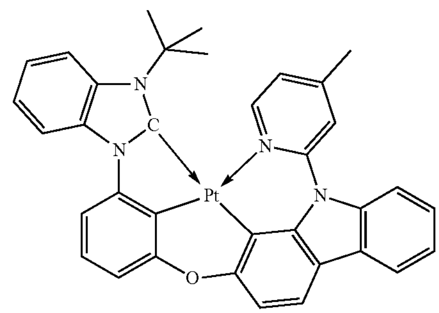
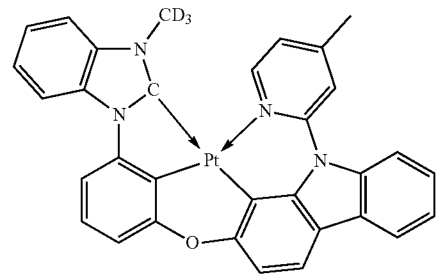

-continued
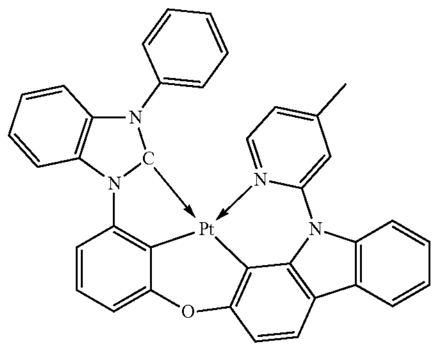
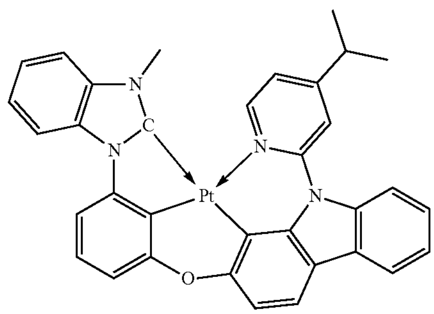
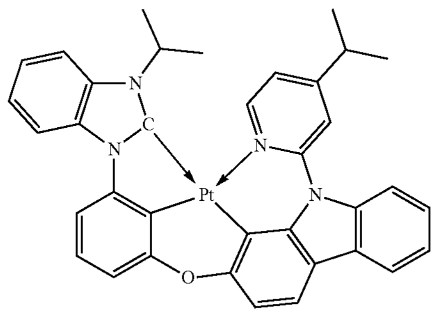
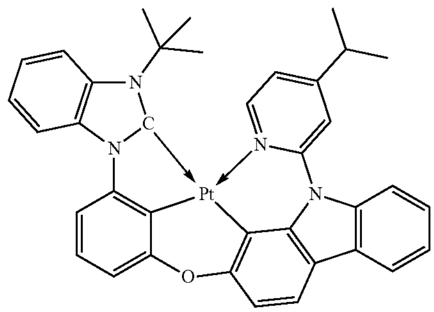
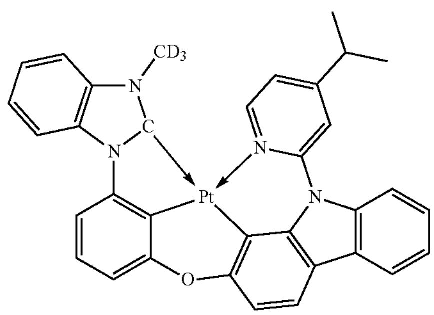
-continued
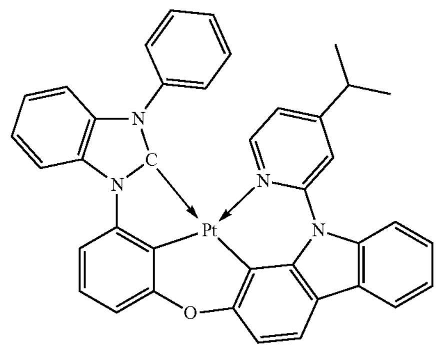
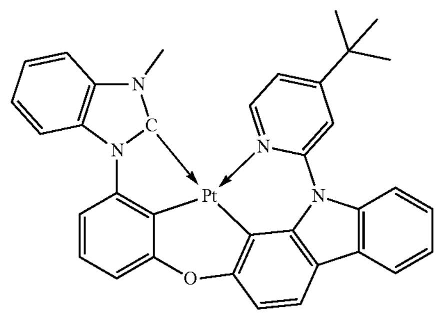
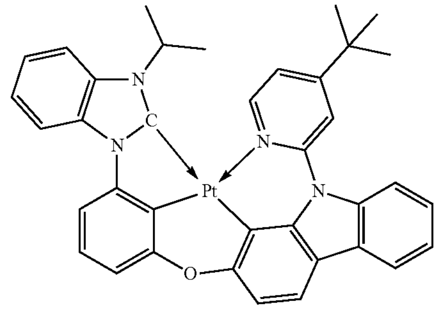
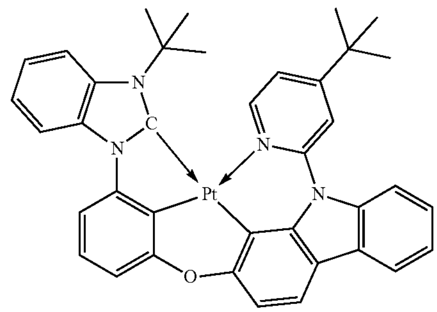
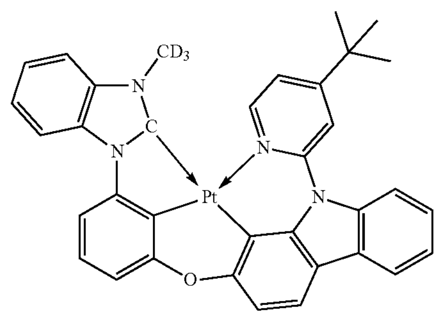

-continued
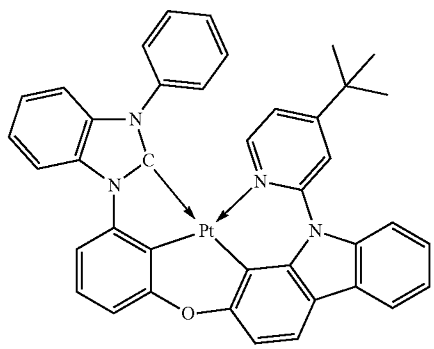
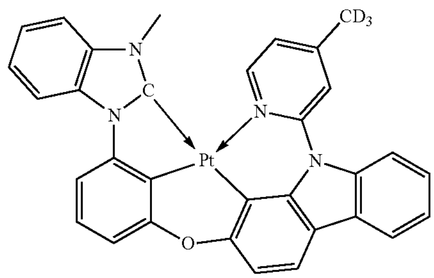
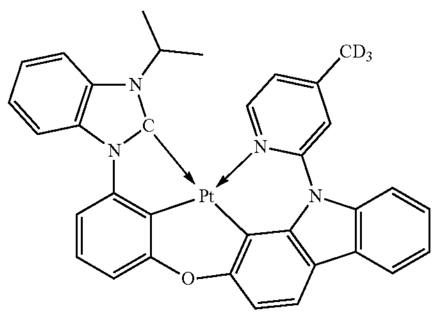
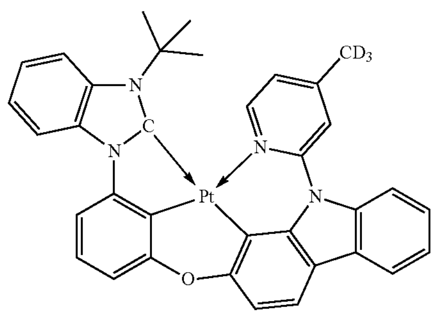
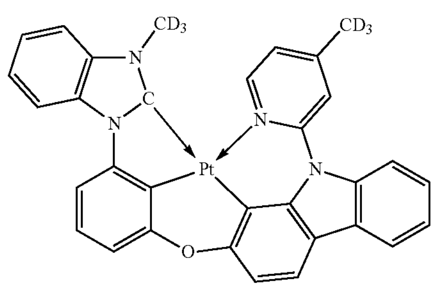
-continued
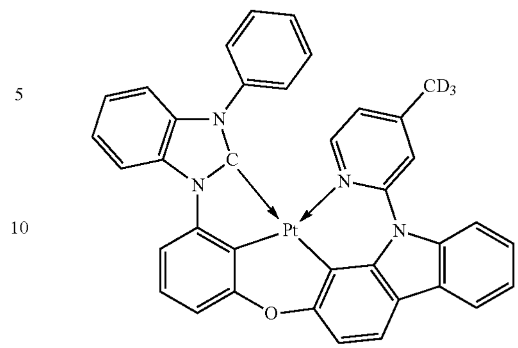
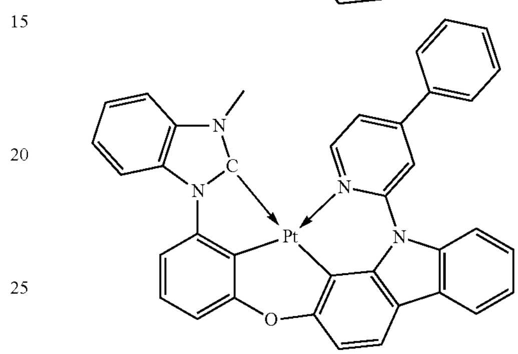
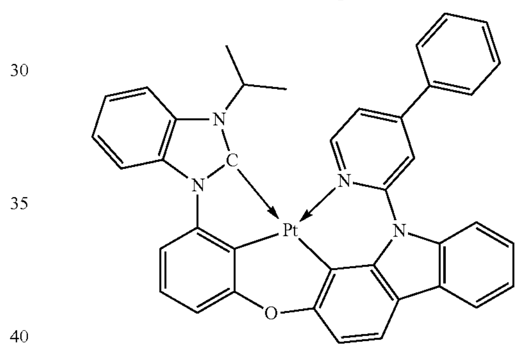
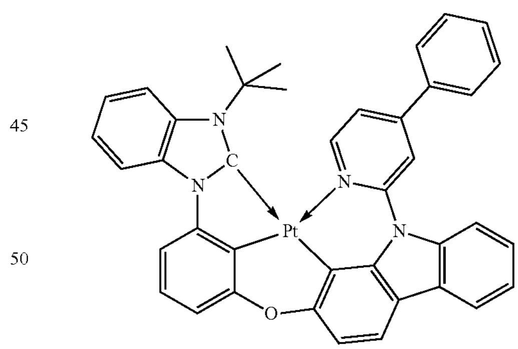
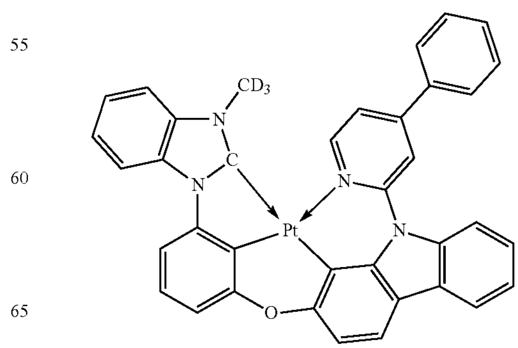

-continued
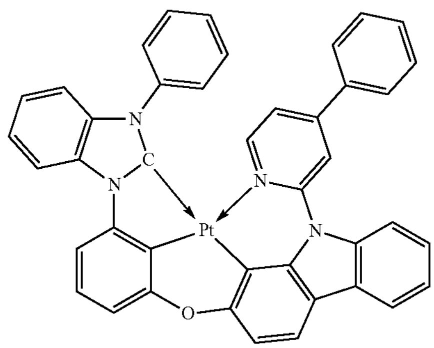
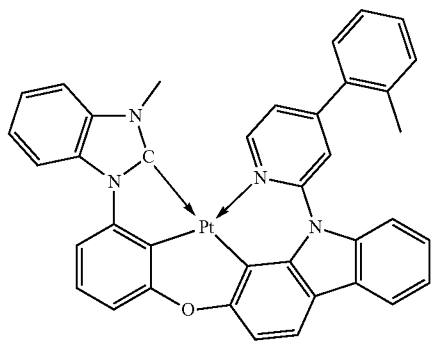
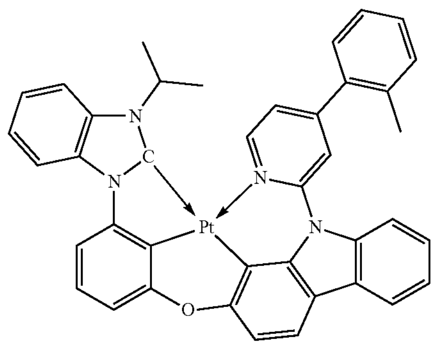
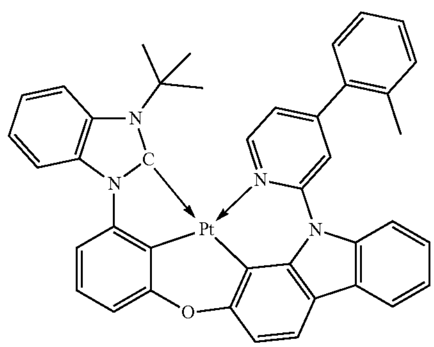
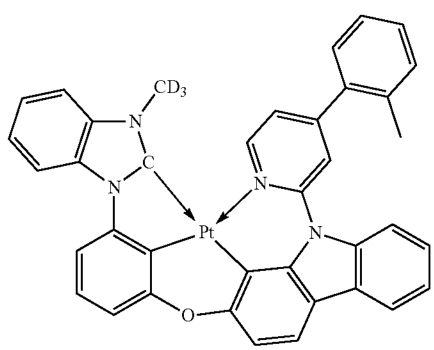
-continued
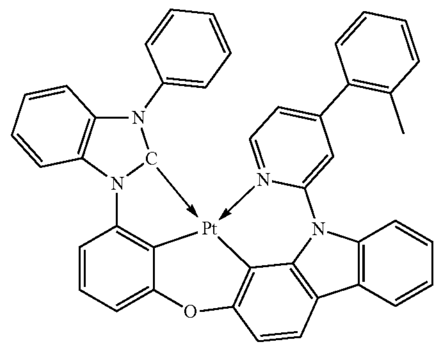
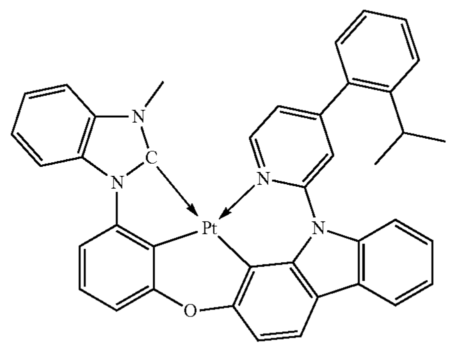
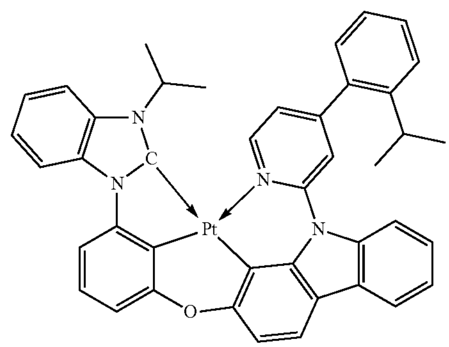
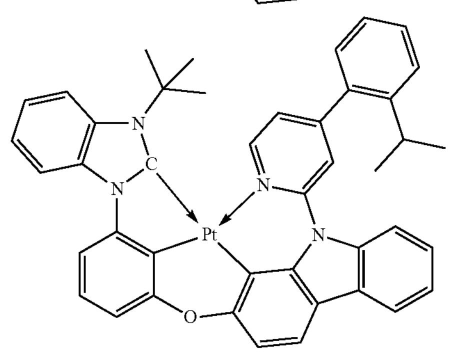
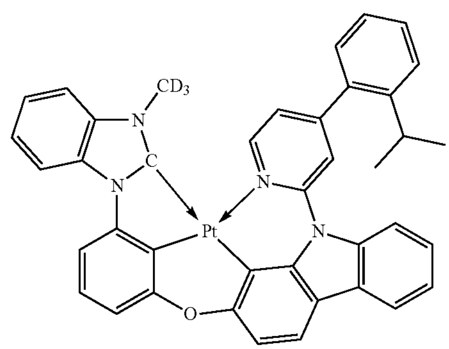

-continued
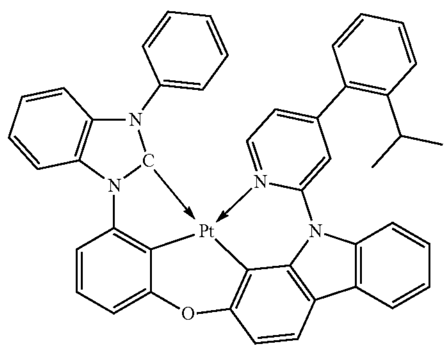
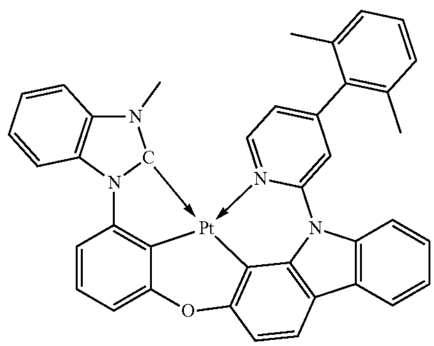
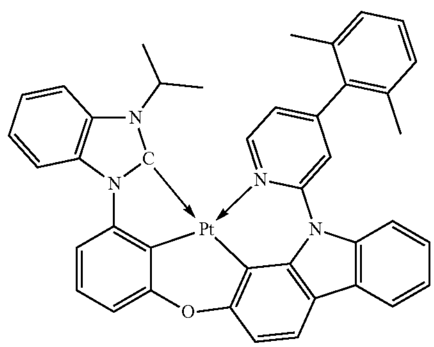
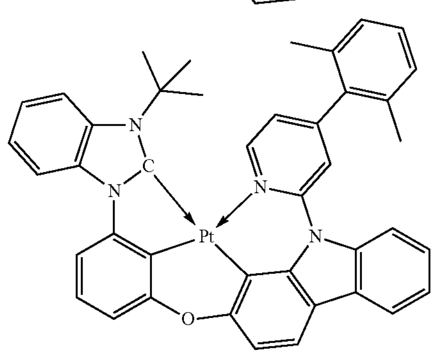
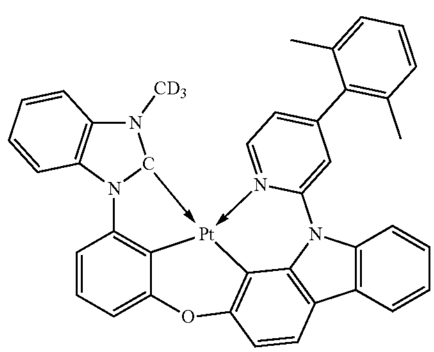
-continued
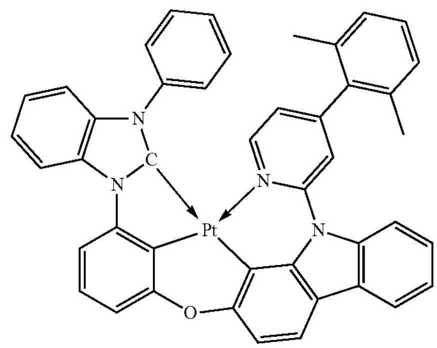
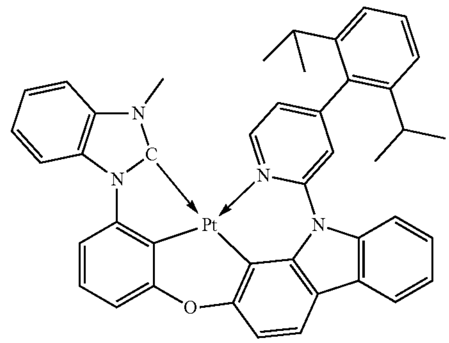
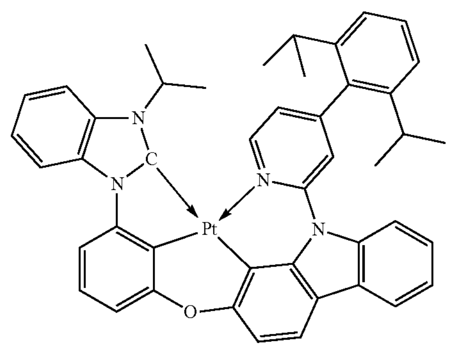
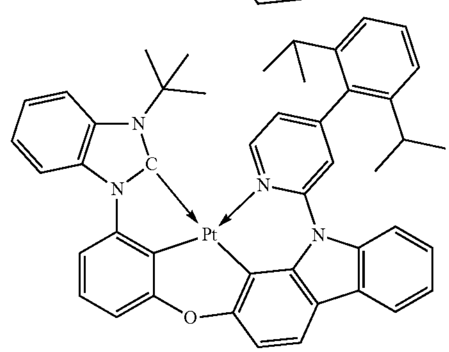
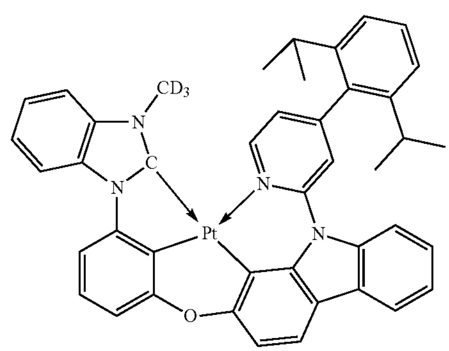

-continued
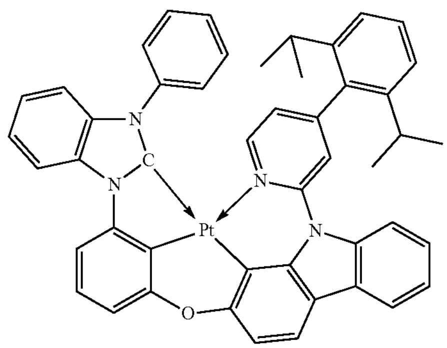
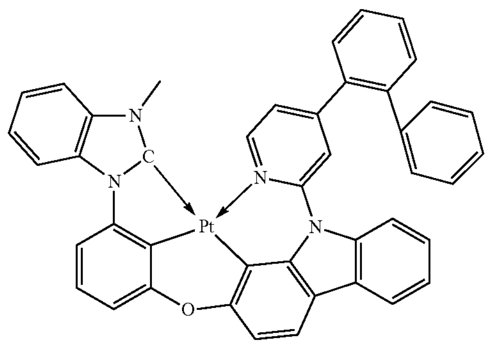
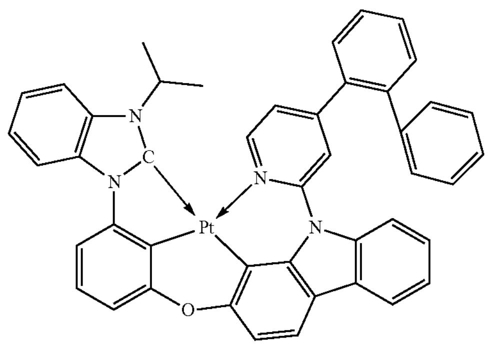
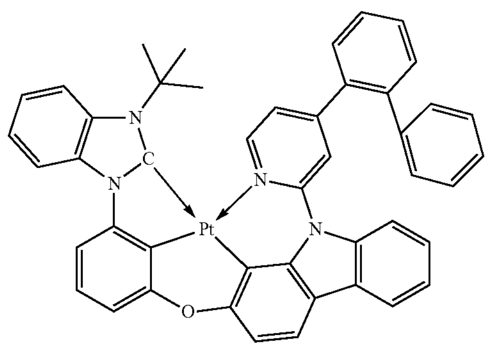
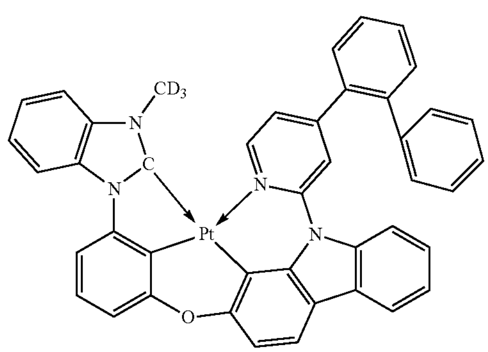
-continued
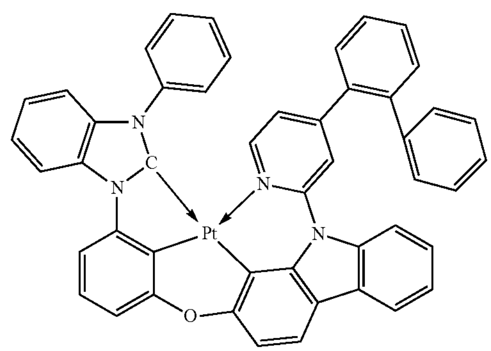
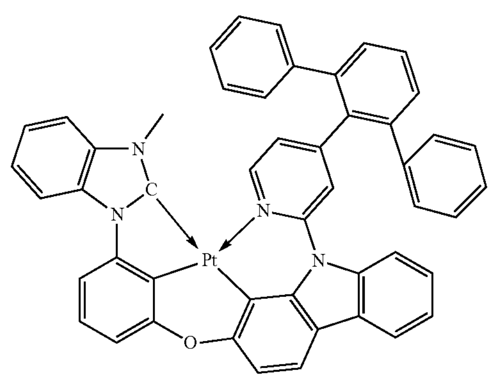
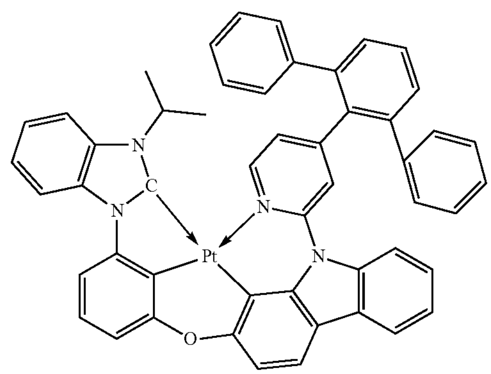
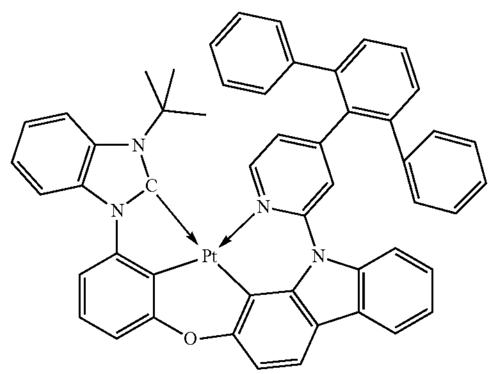

-continued
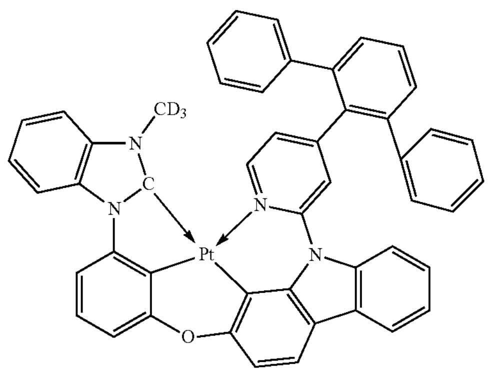
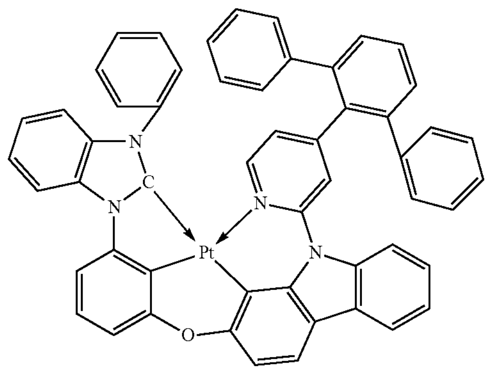
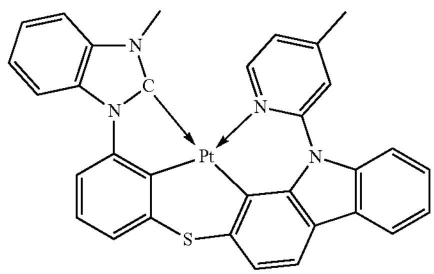
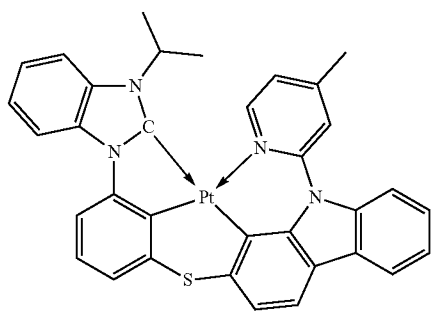
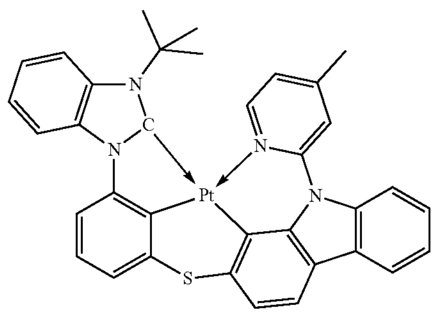
-continued
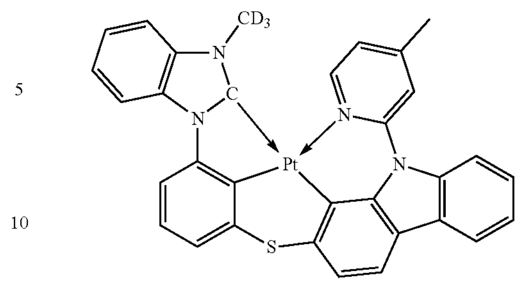
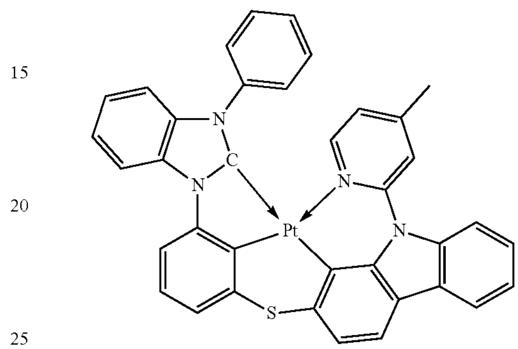
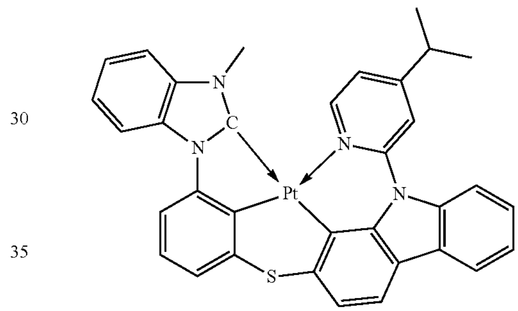
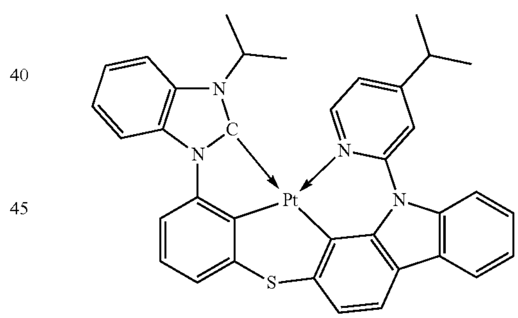
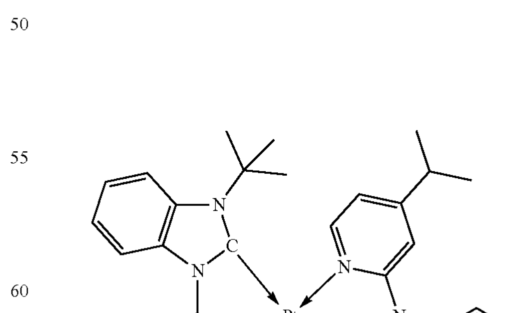
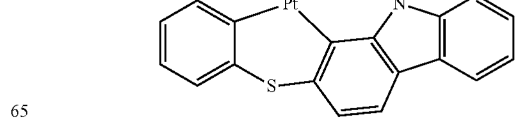

-continued
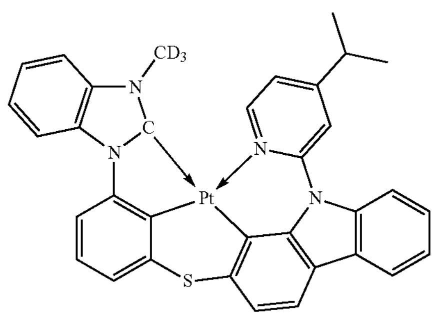
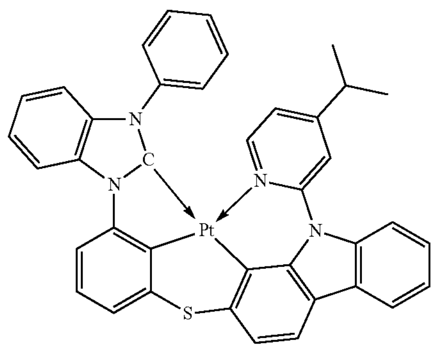
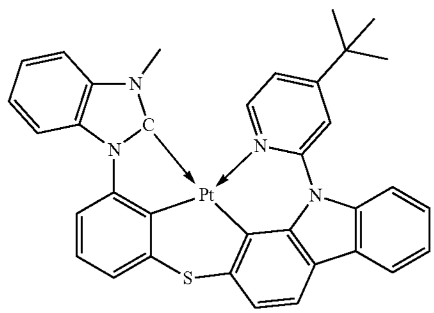
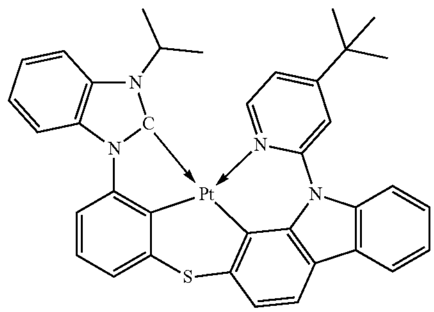
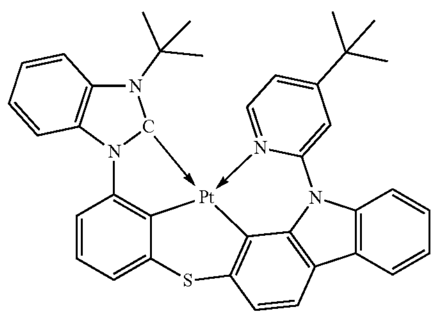
-continued
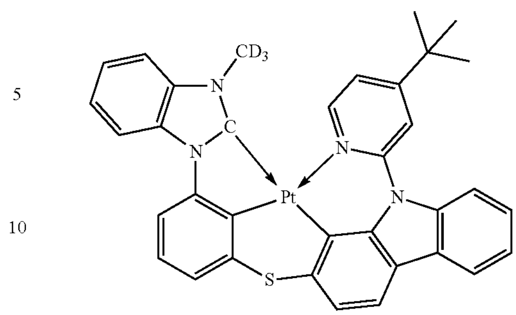
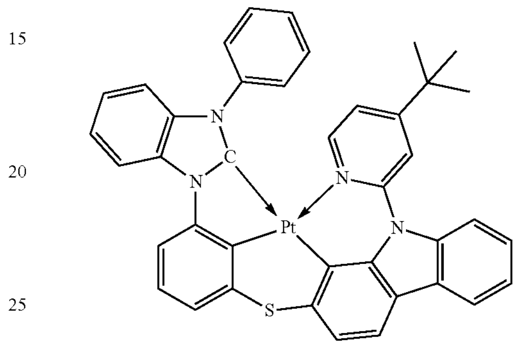
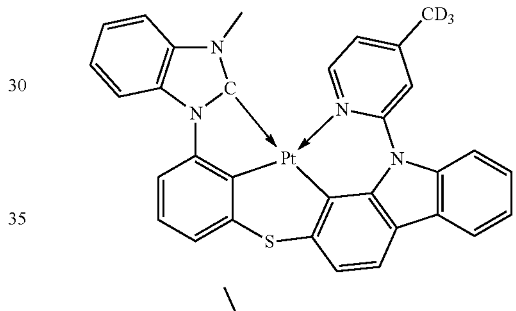
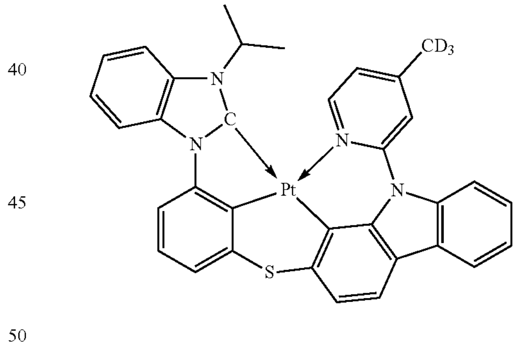
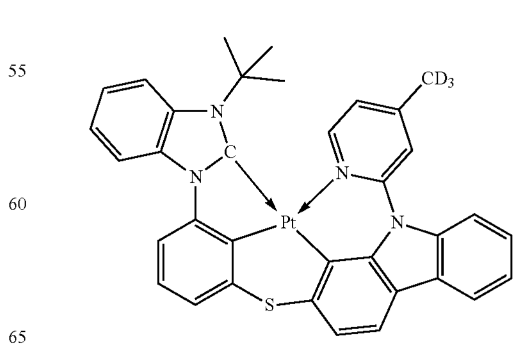

-continued
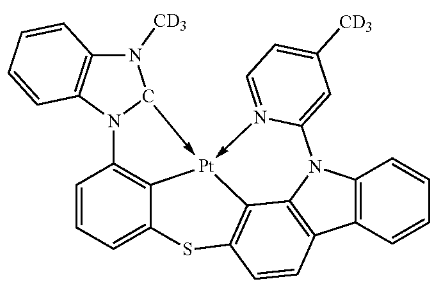
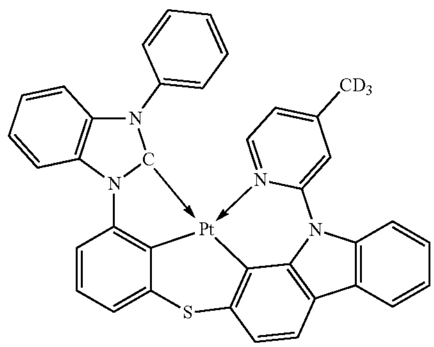
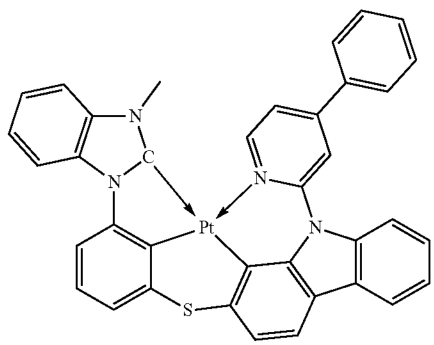
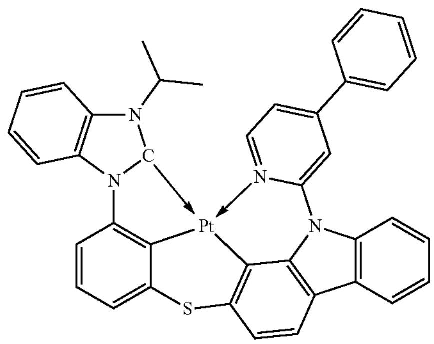
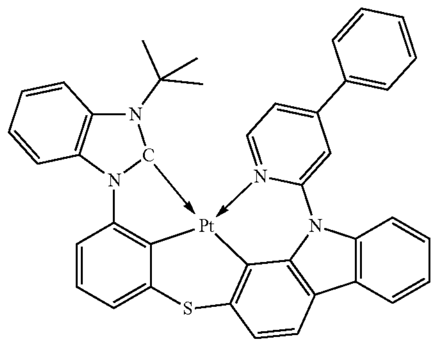
-continued
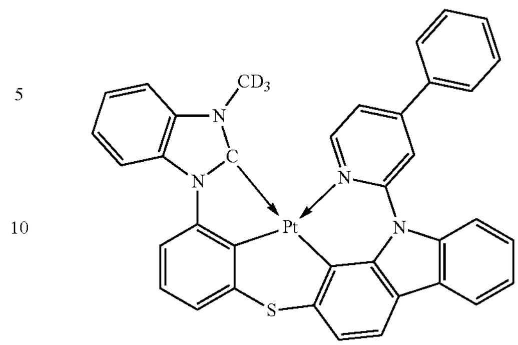
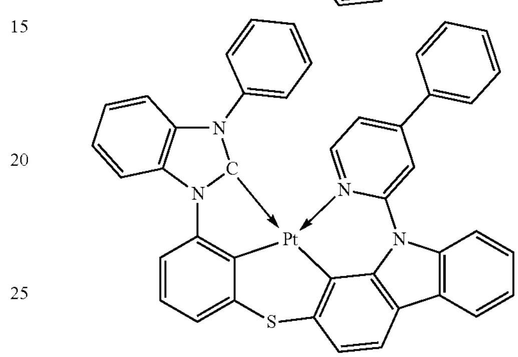
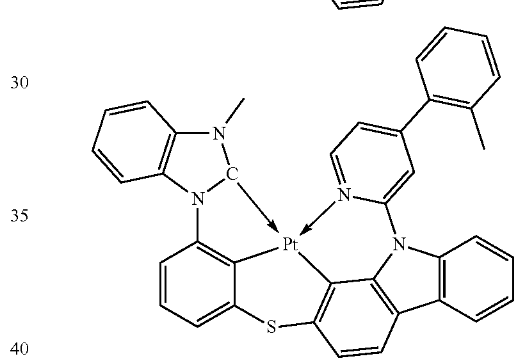
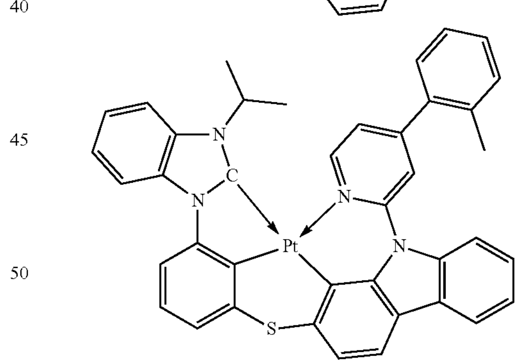
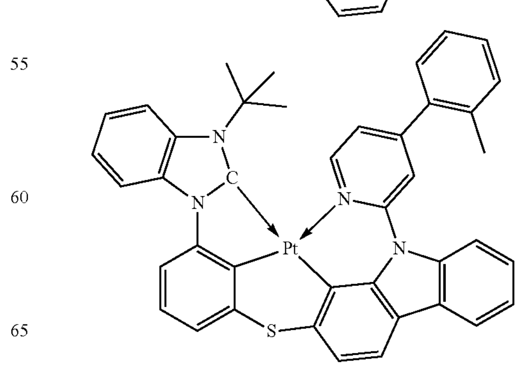
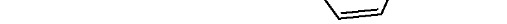

-continued
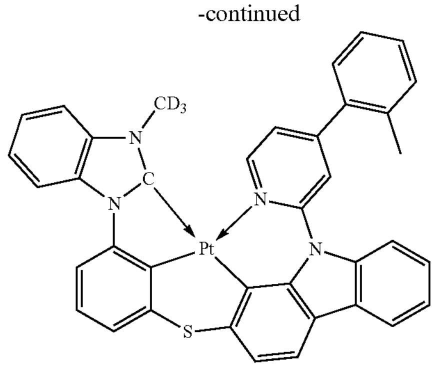
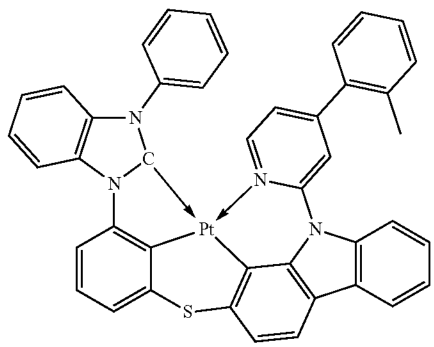
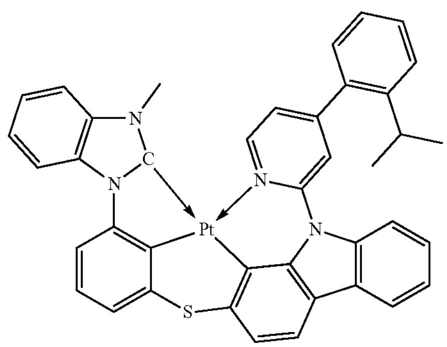
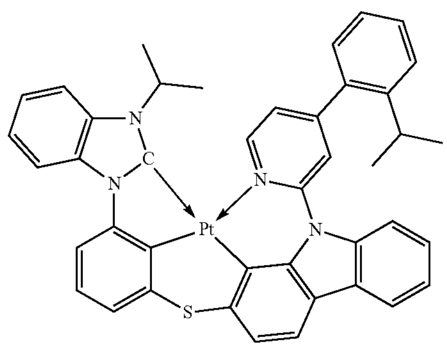
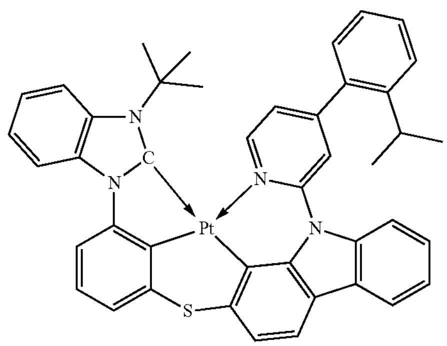
-continued
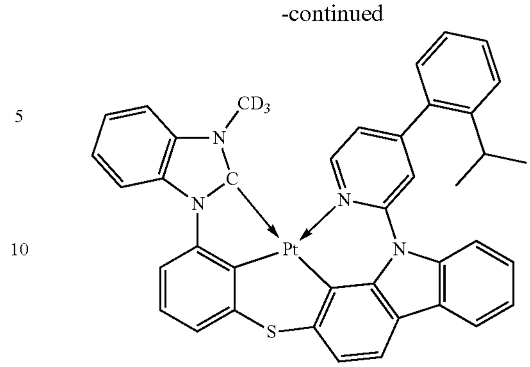
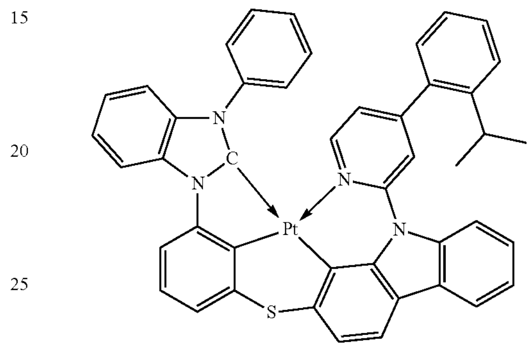
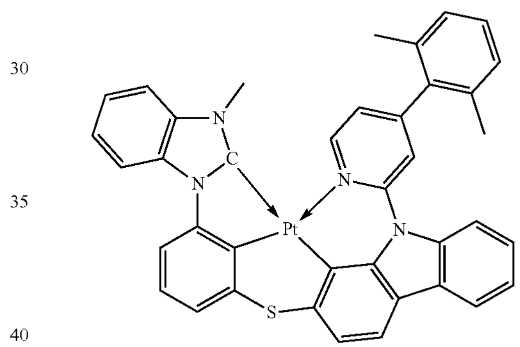
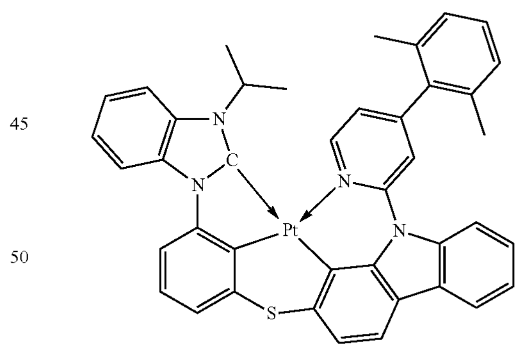
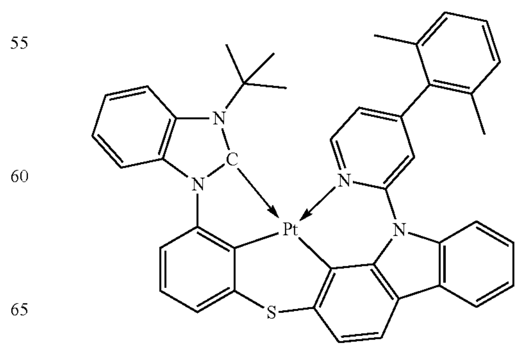

-continued
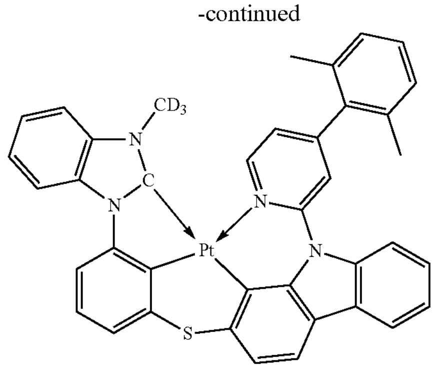
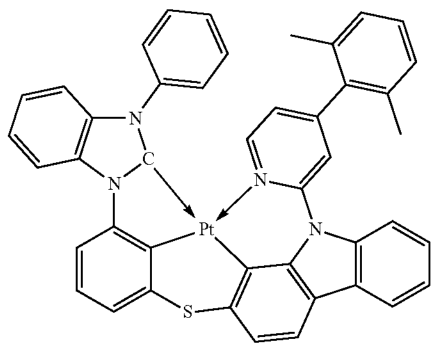
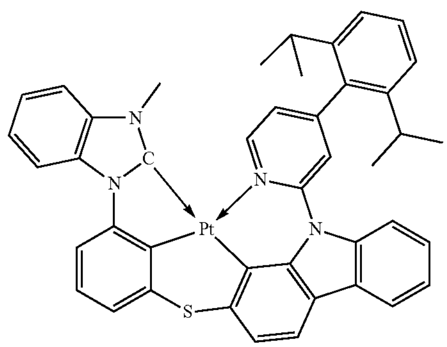
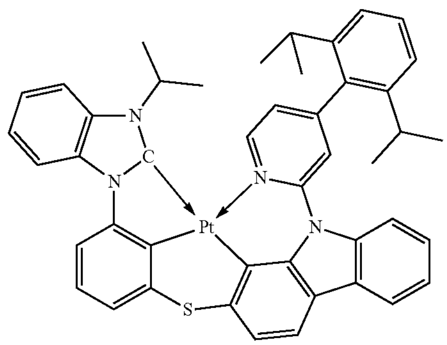
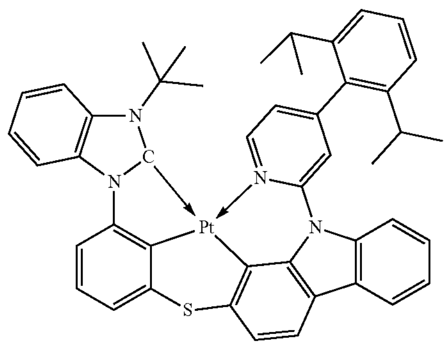
-continued
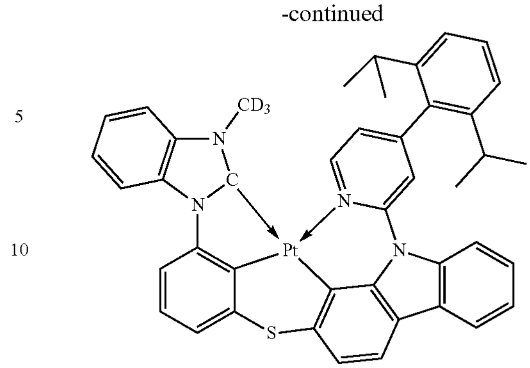
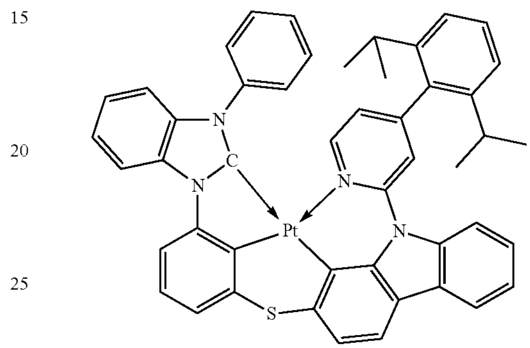
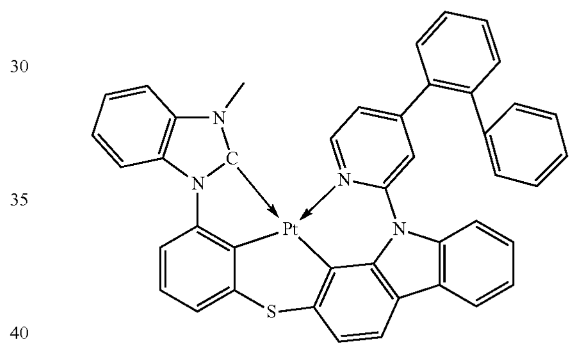
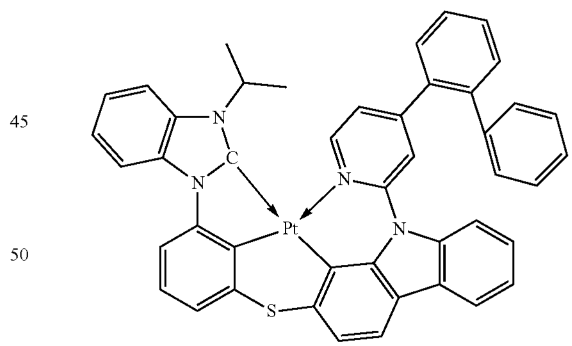
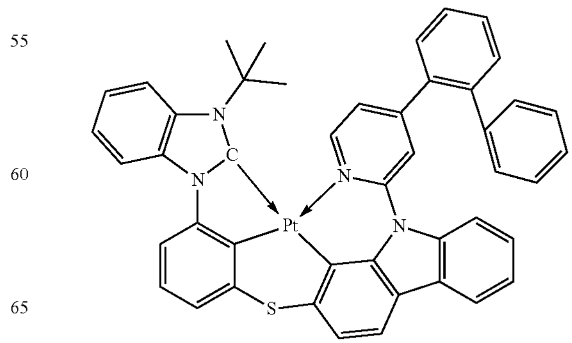

-continued
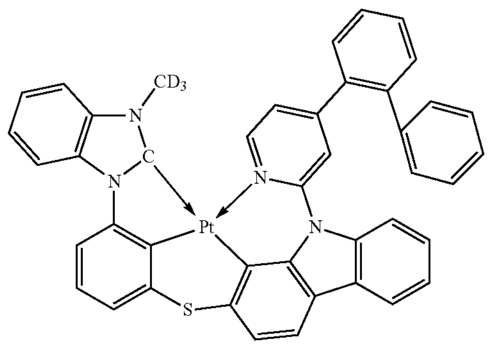
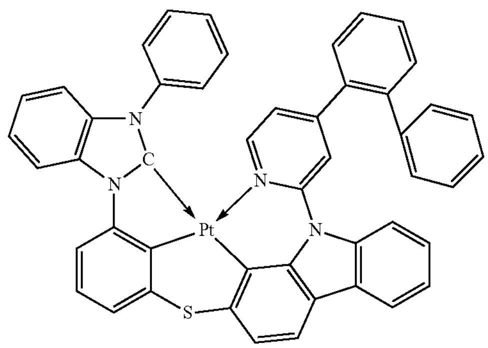
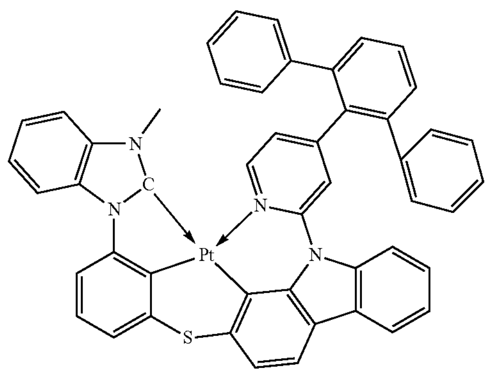
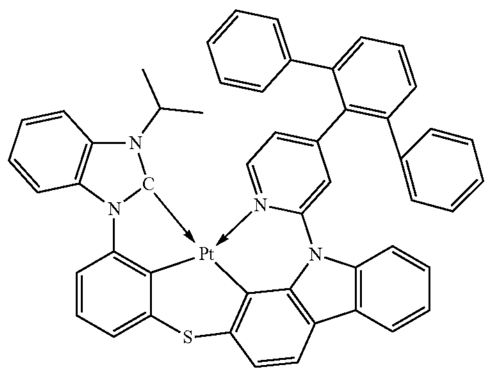
-continued
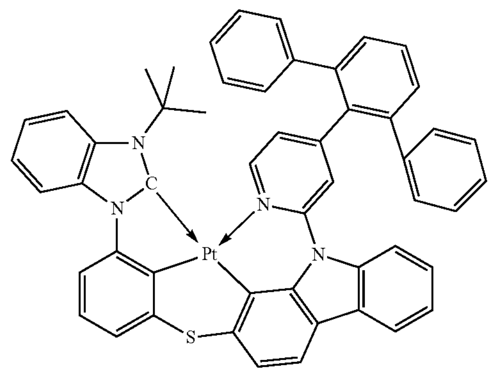
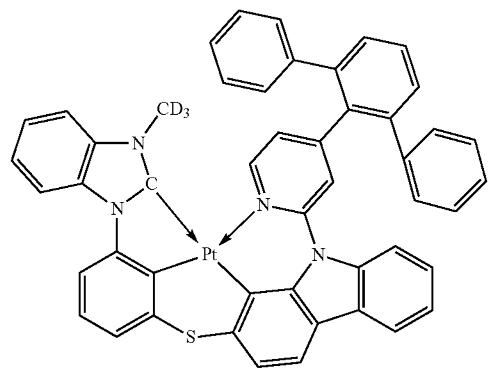
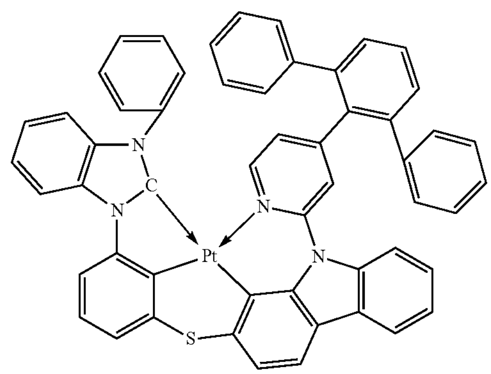
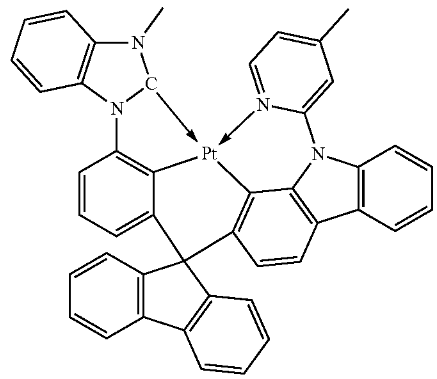

-continued
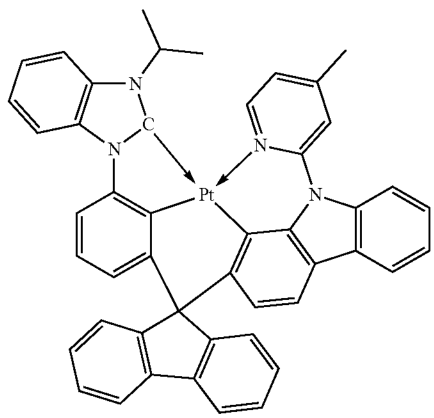
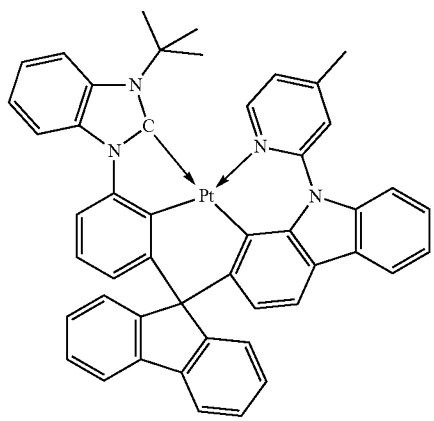
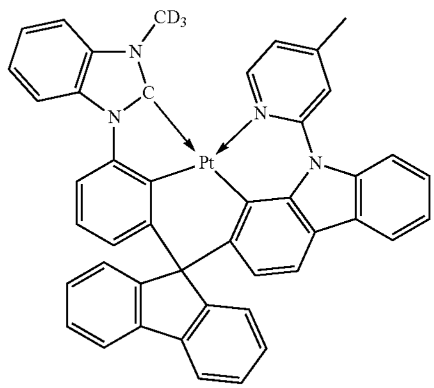
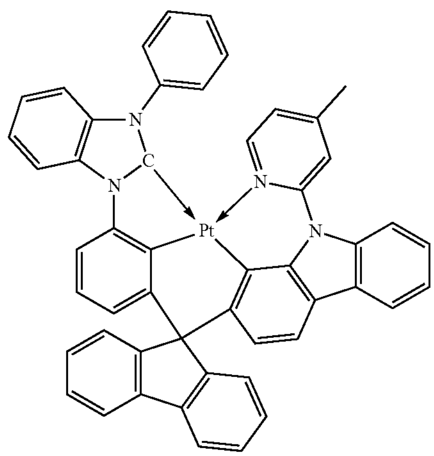
-continued
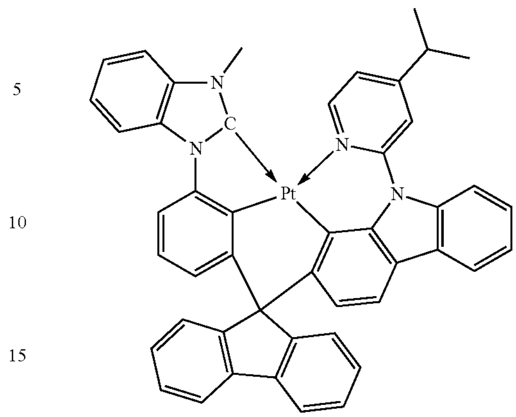
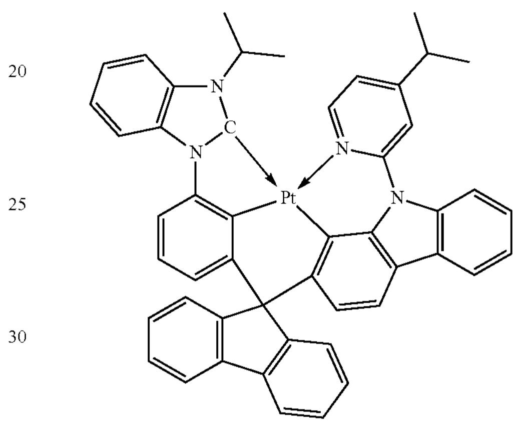
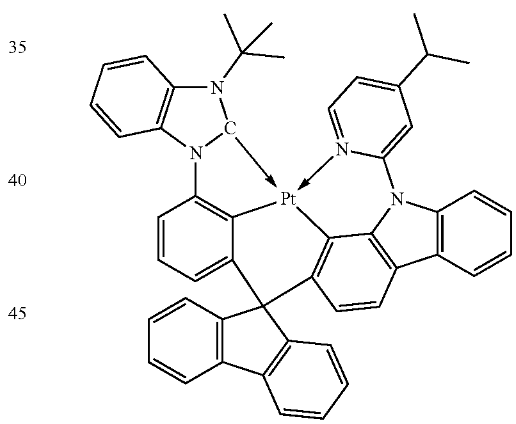
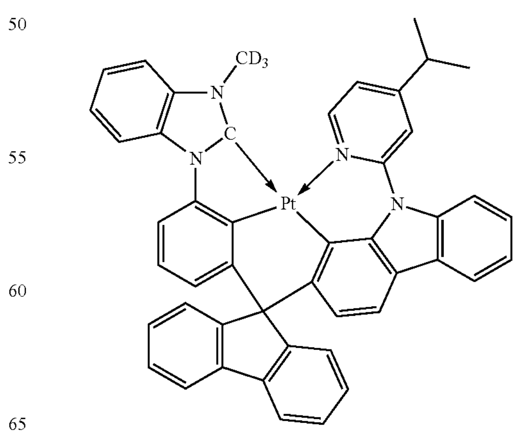

-continued
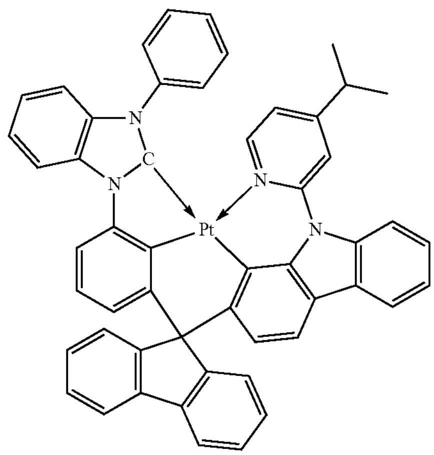
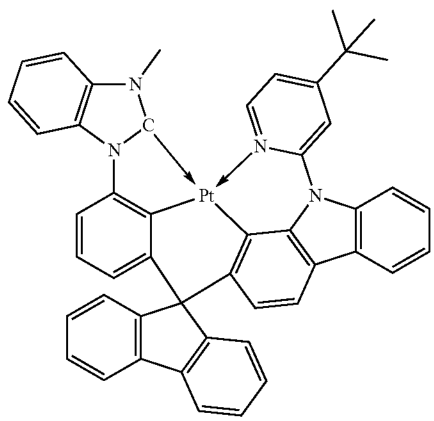
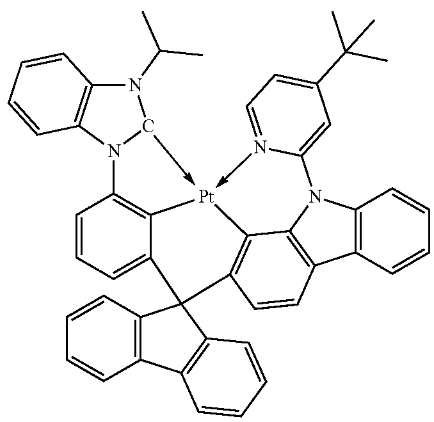
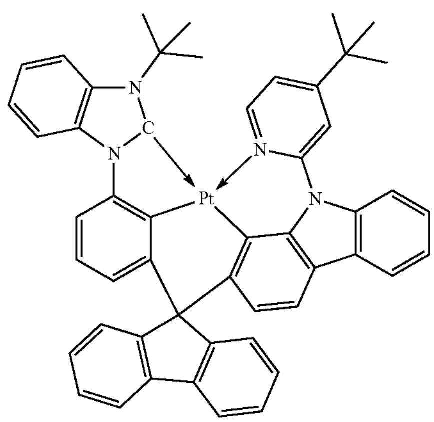
-continued
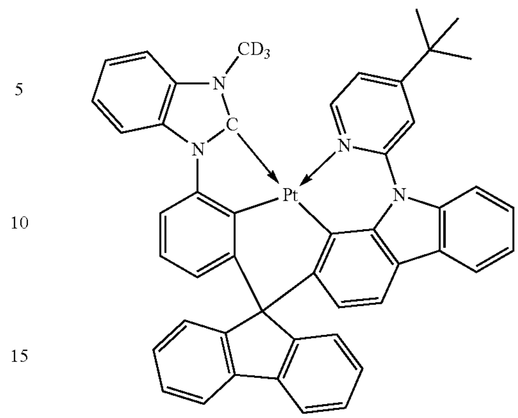
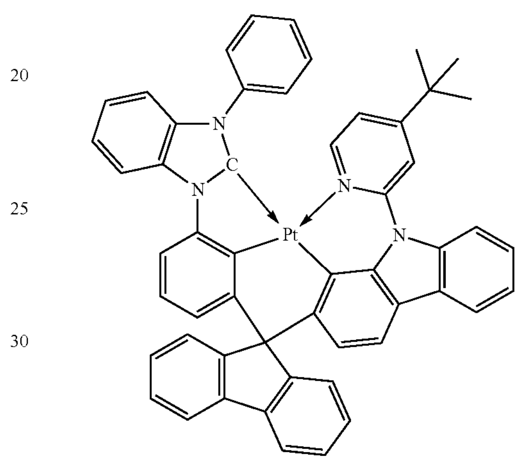
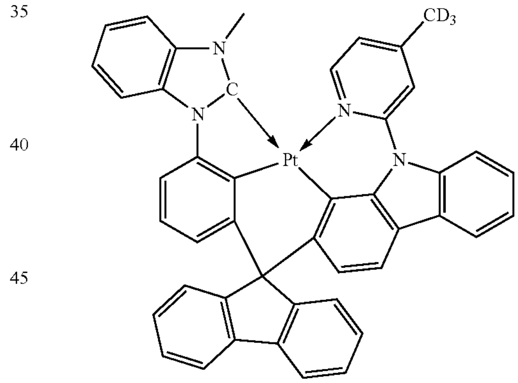
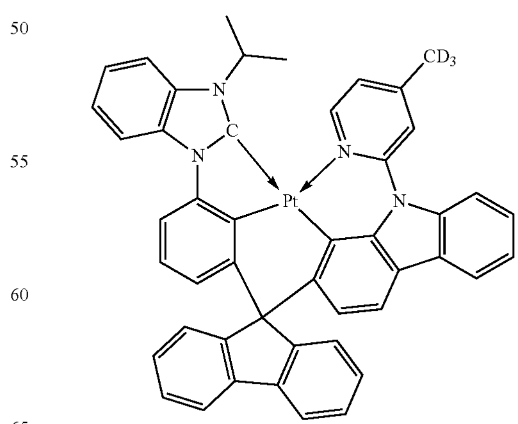
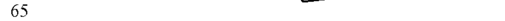
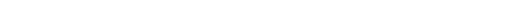
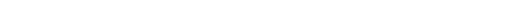
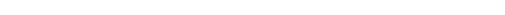
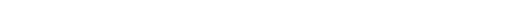
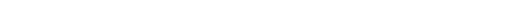
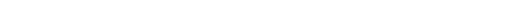
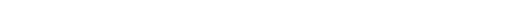
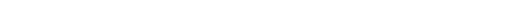

-continued
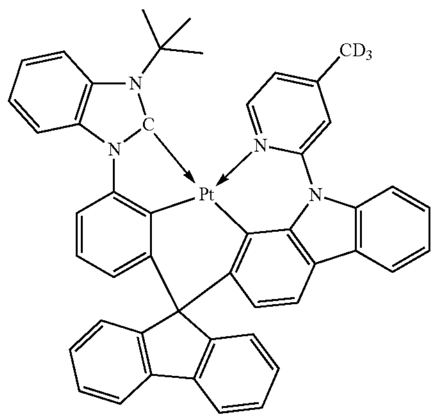
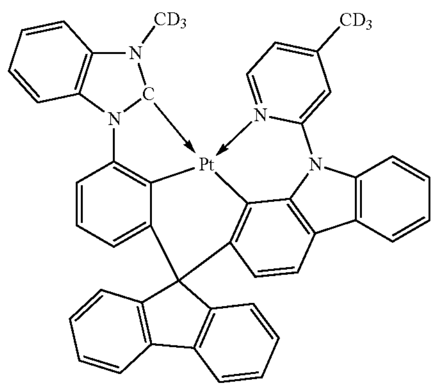
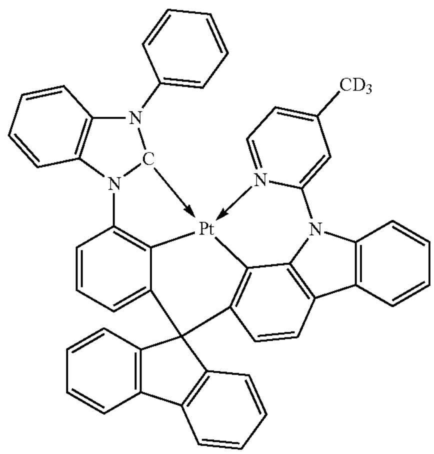
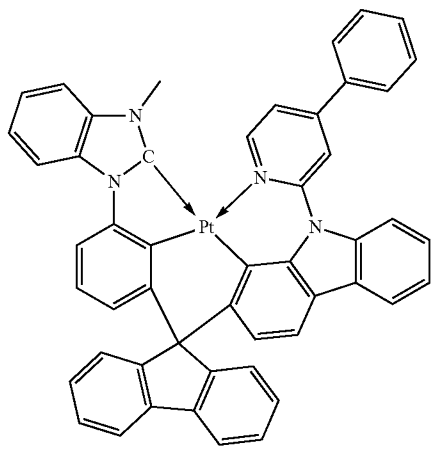
-continued
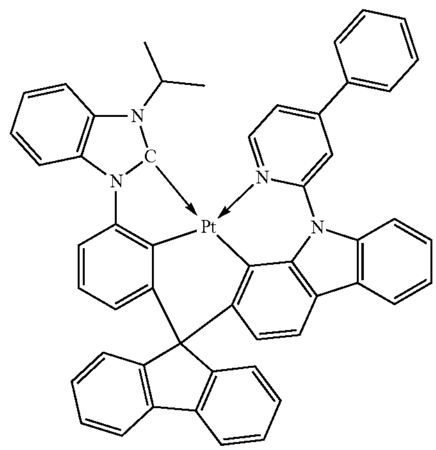
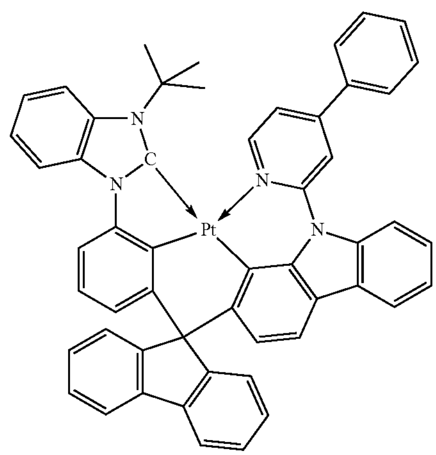
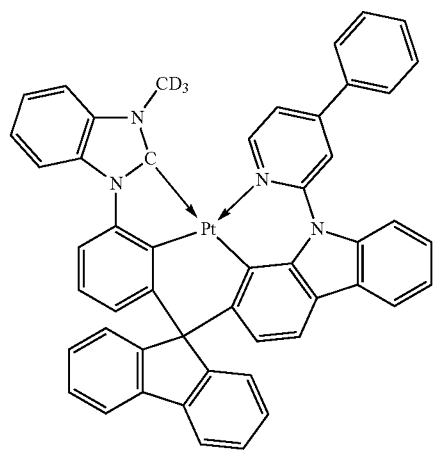

-continued
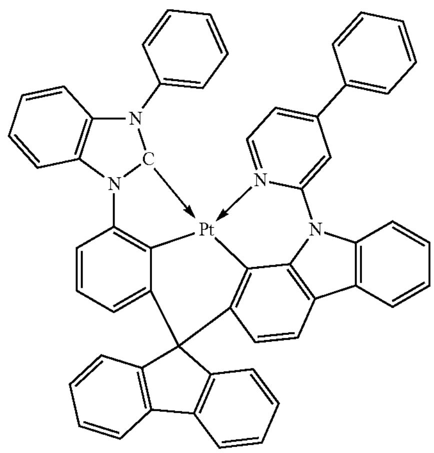
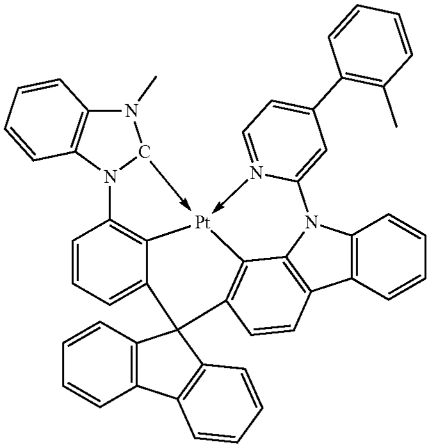
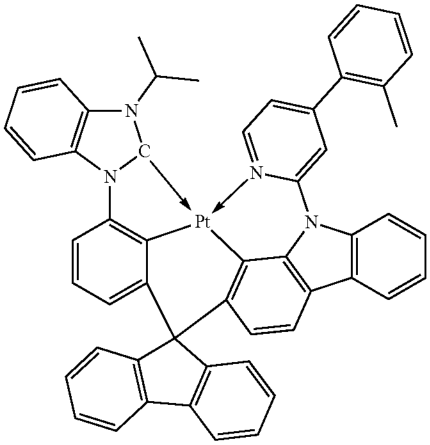
-continued
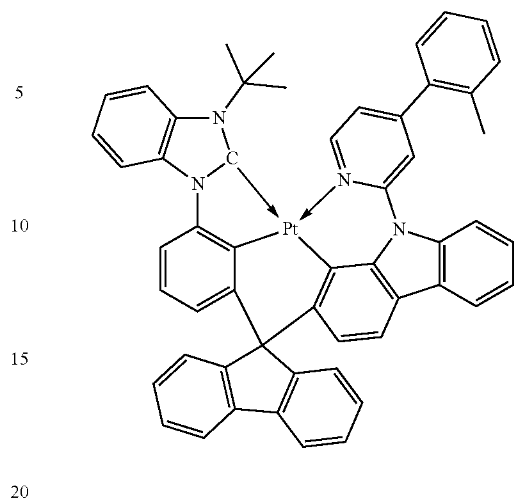
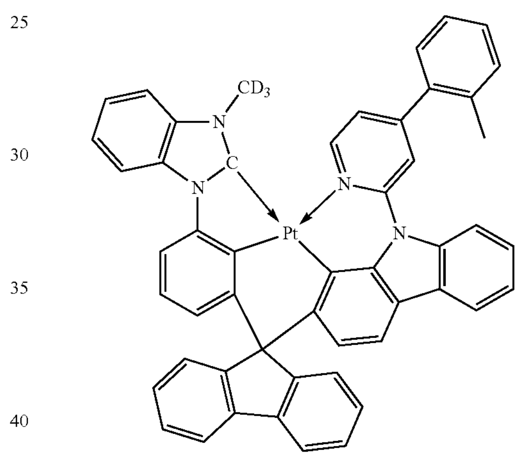
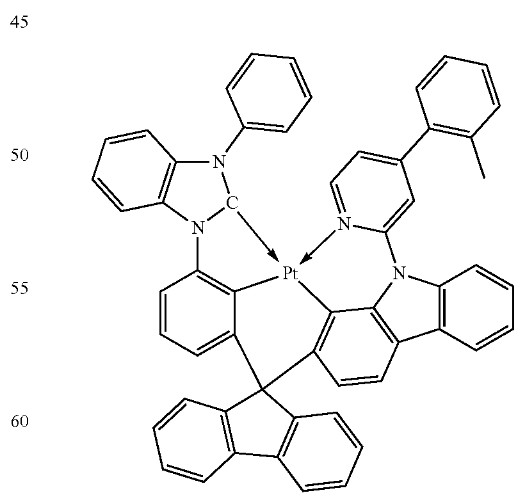

-continued
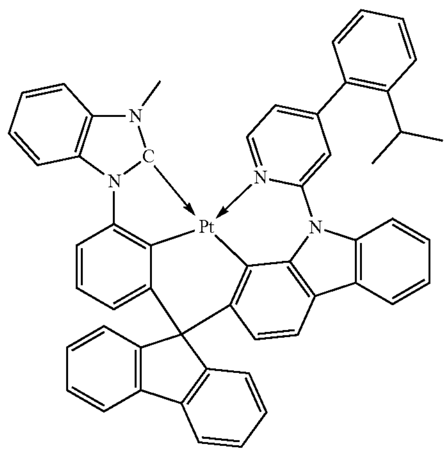
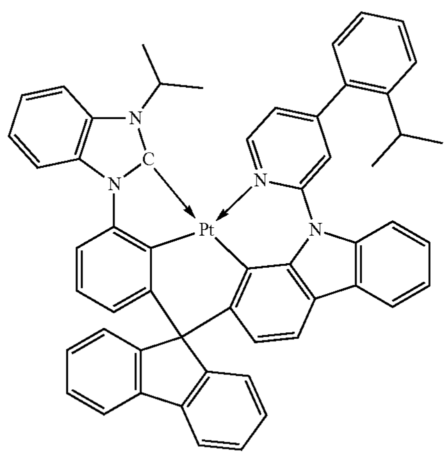
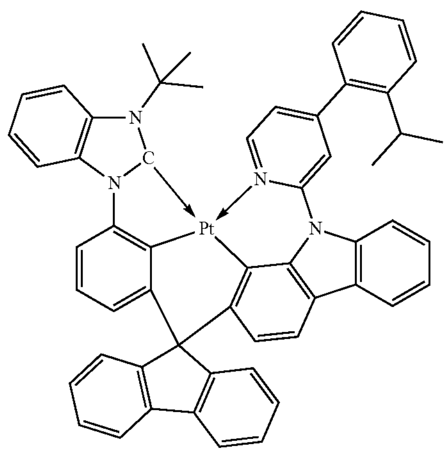
-continued
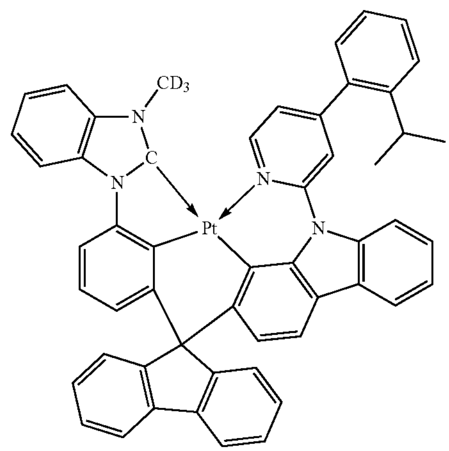
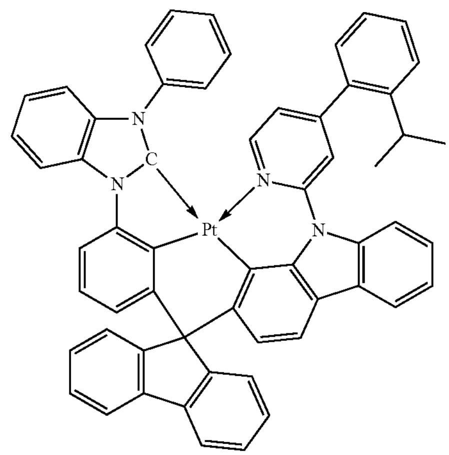
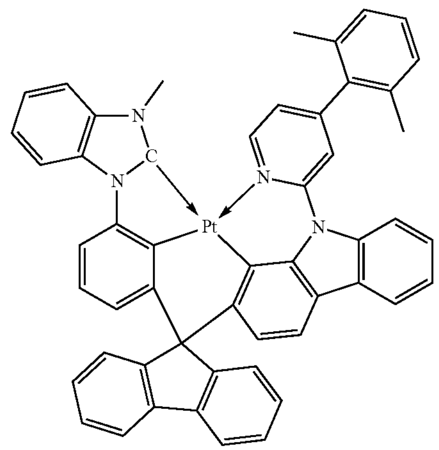

-continued
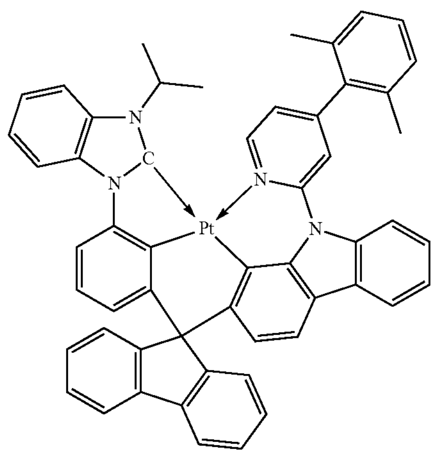
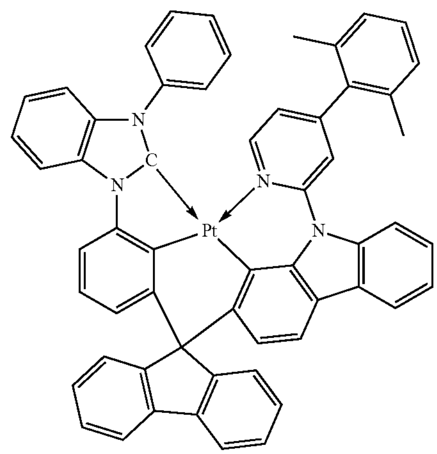
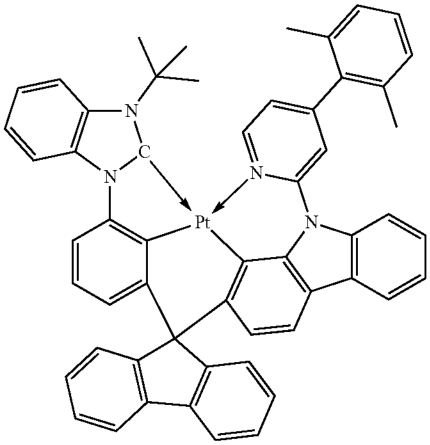
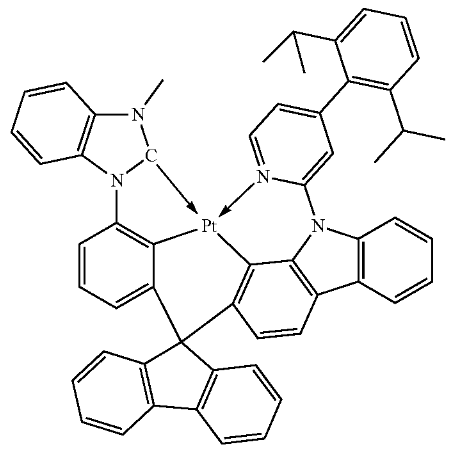
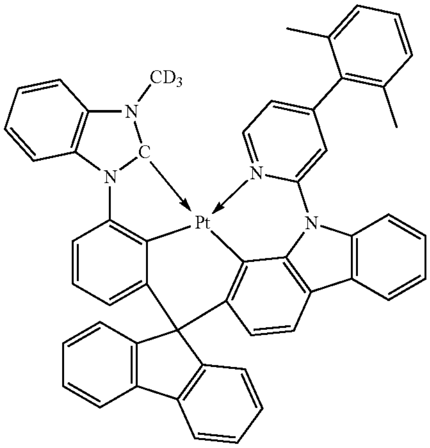
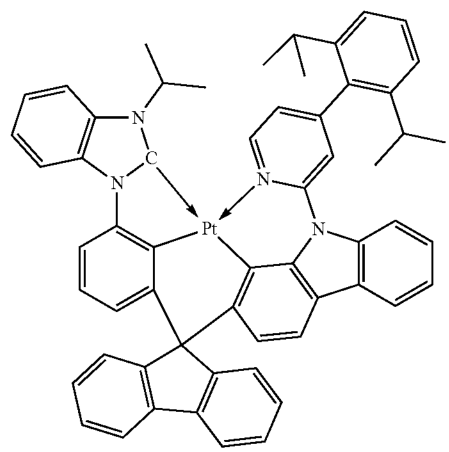

-continued
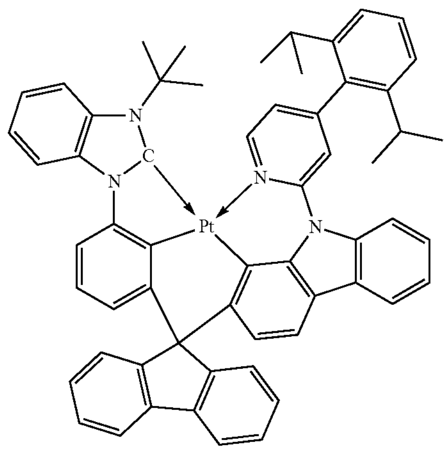
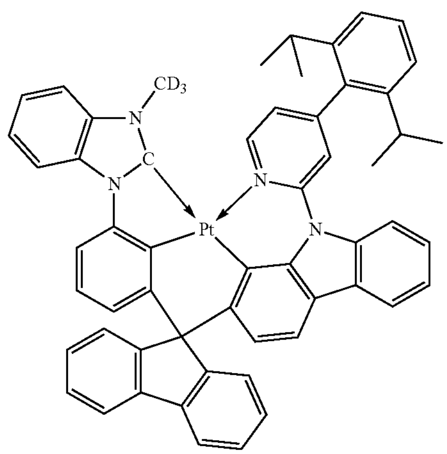
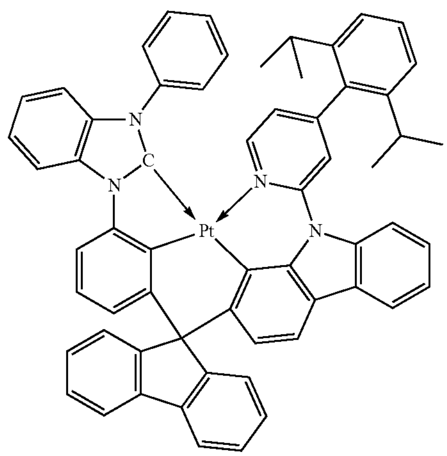
-continued
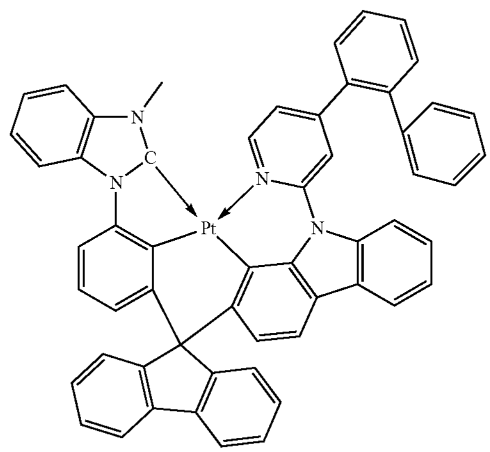
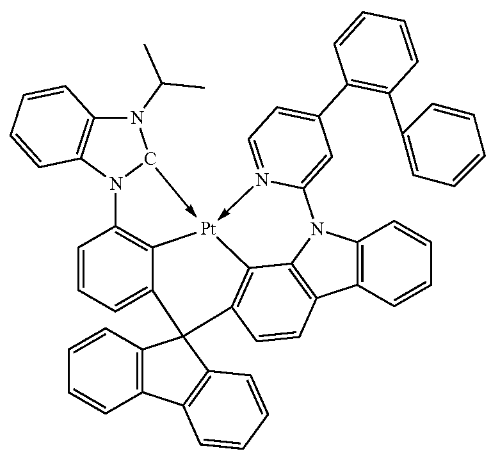
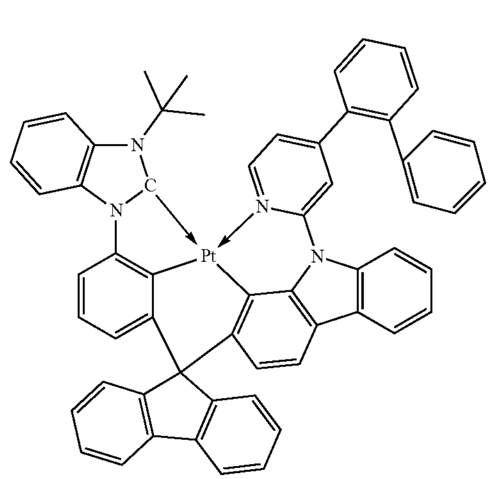

-continued
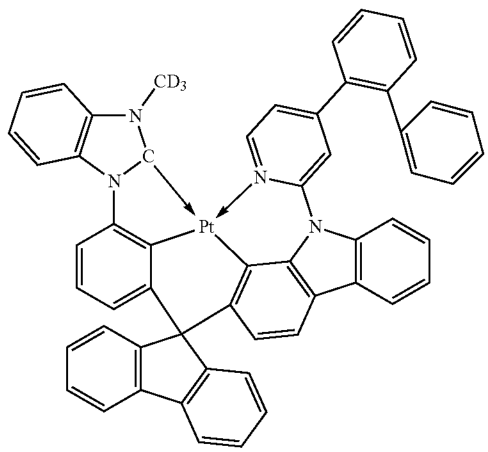
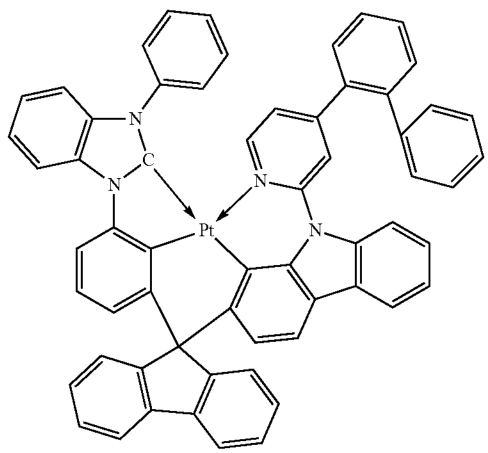
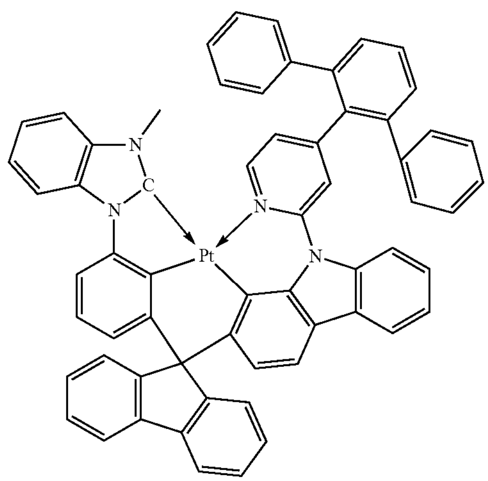
-continued
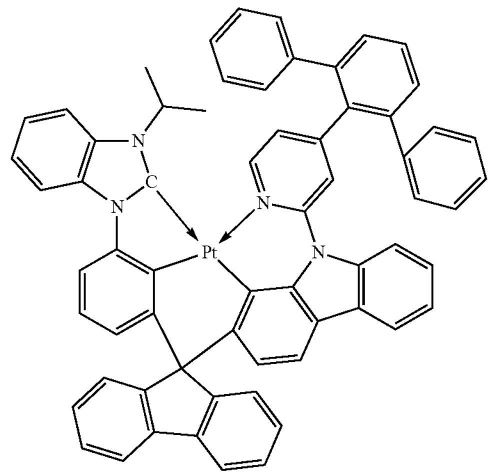
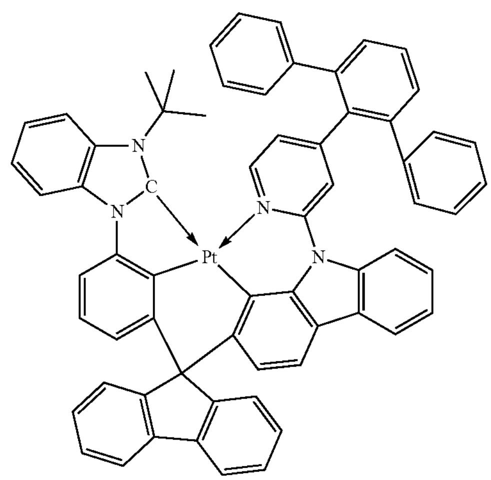
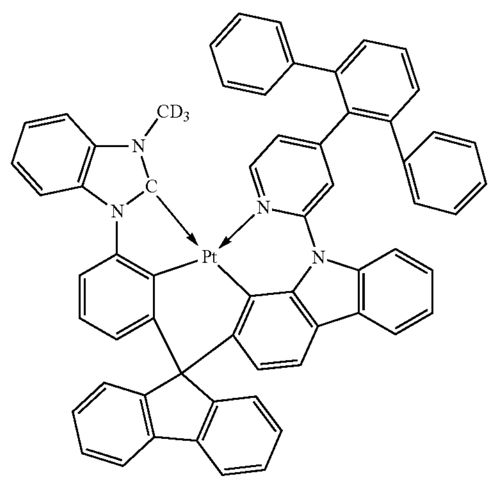

-continued
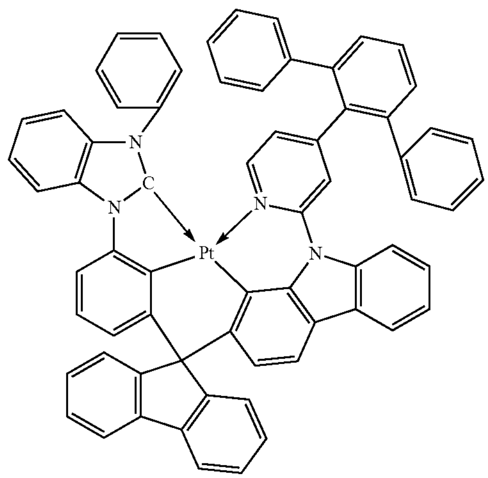
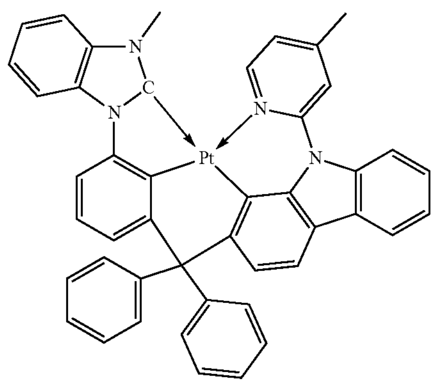
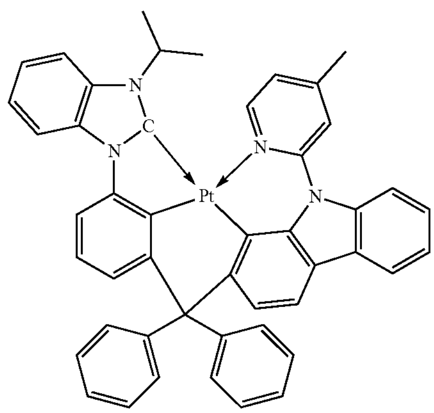
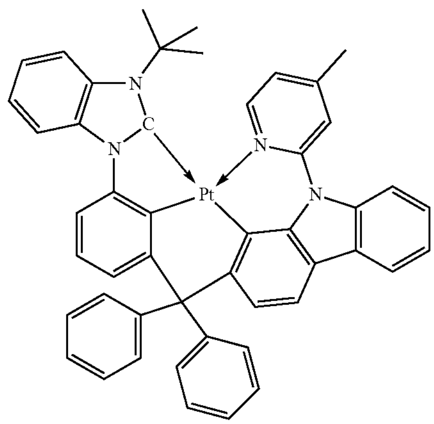
-continued
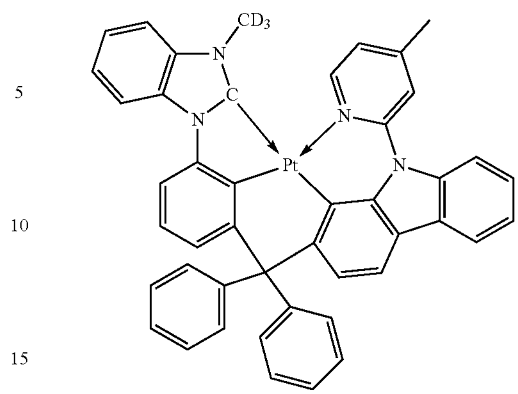
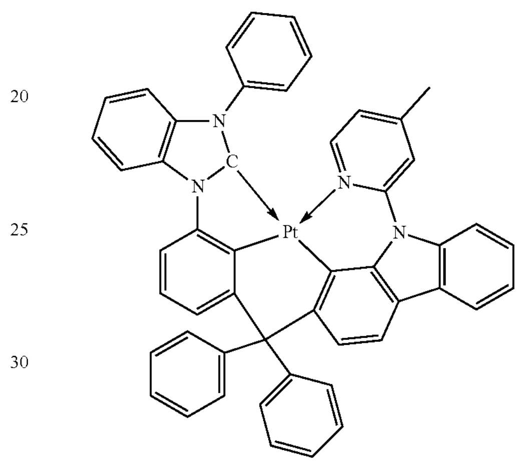
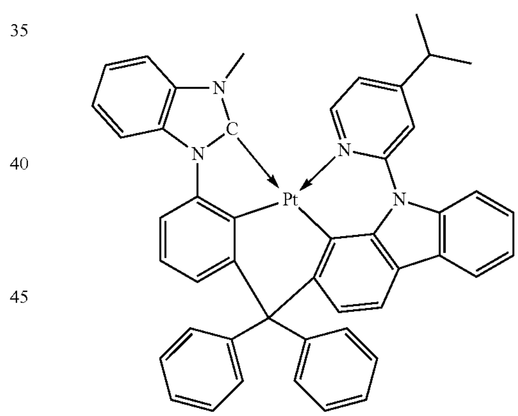
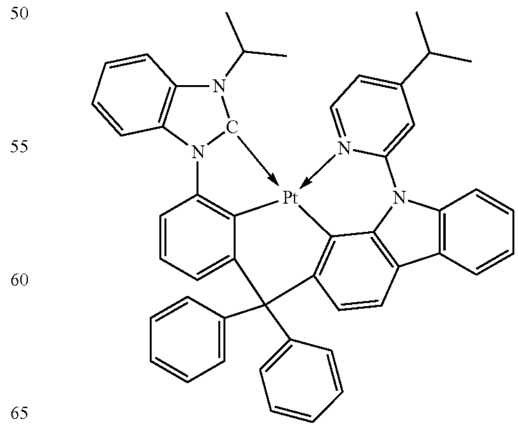

-continued
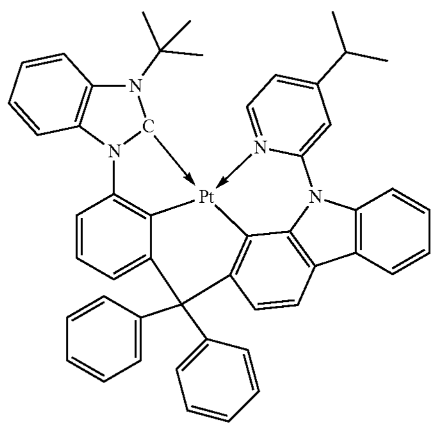
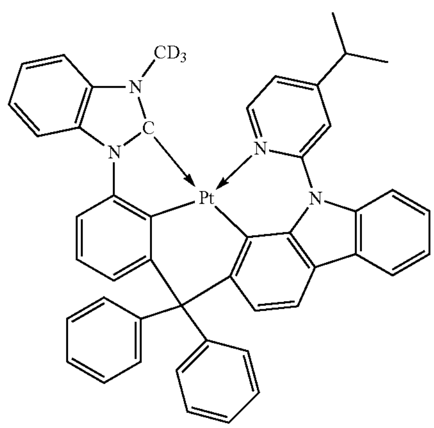
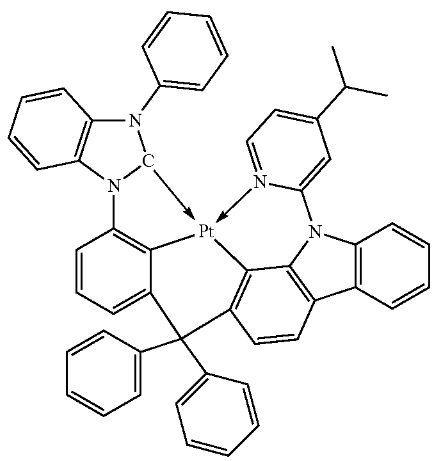
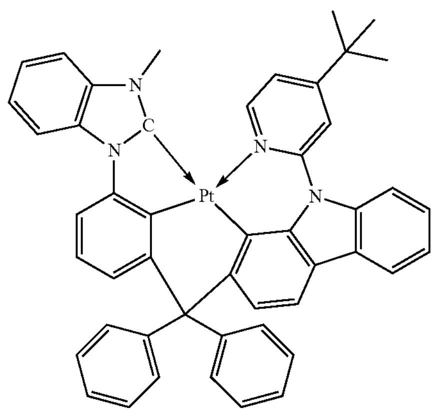
-continued
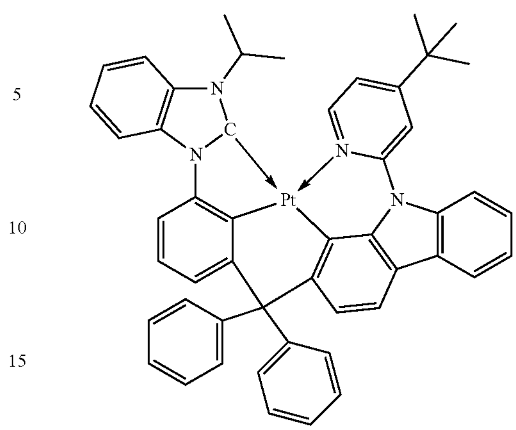
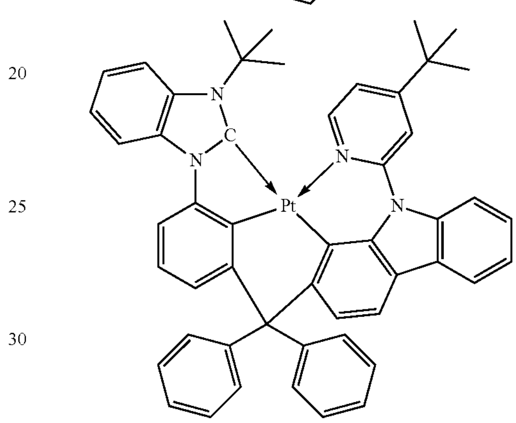
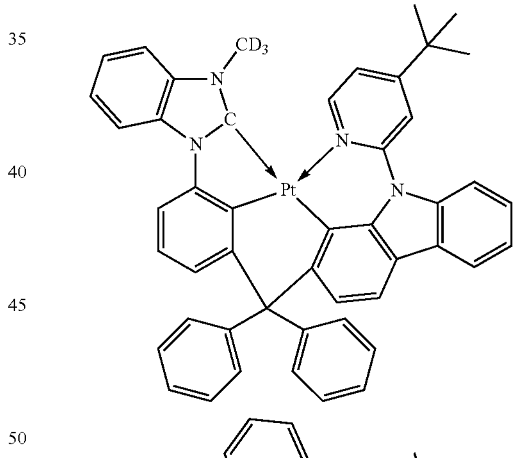
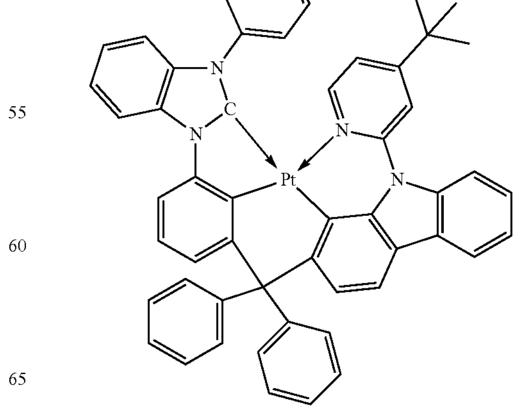

-continued
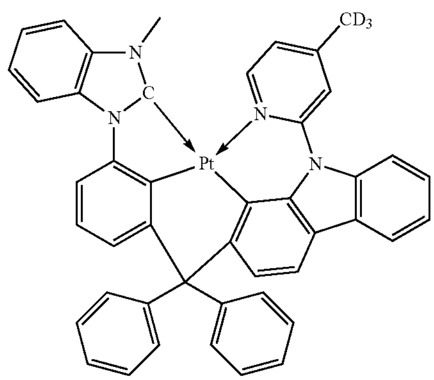
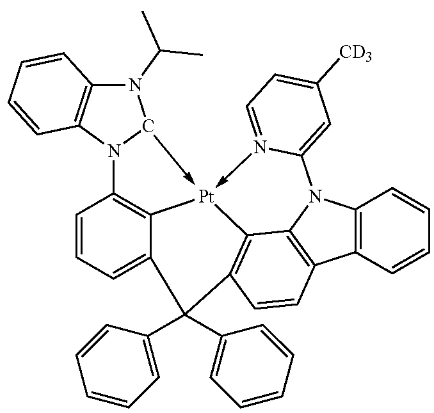
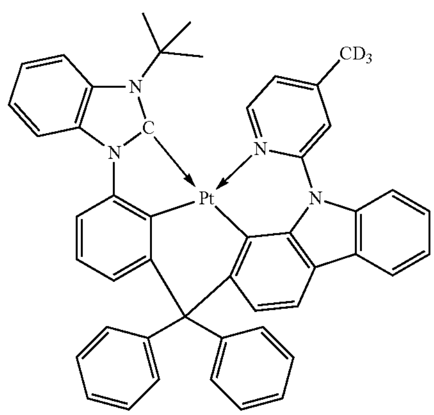
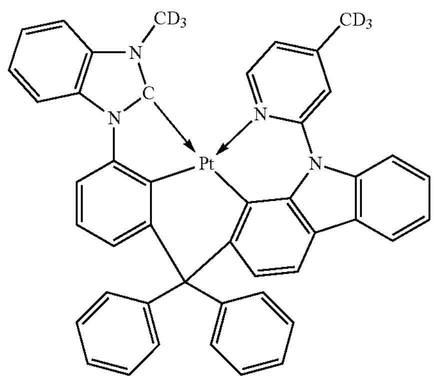
-continued
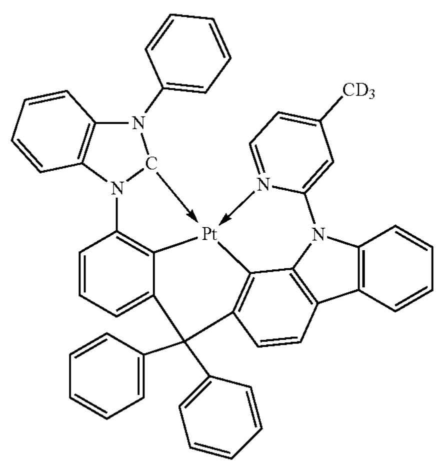
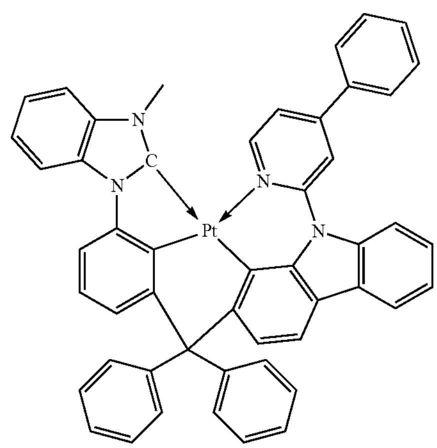
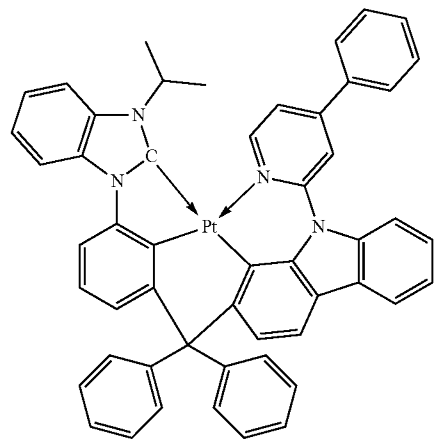

-continued
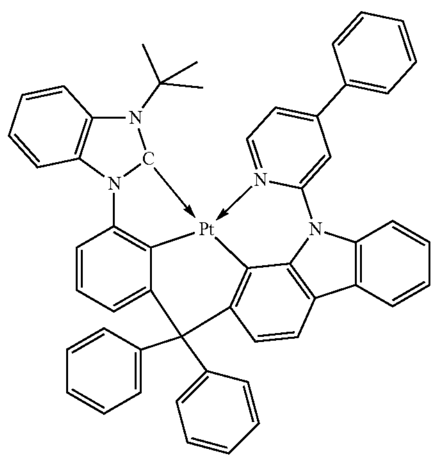
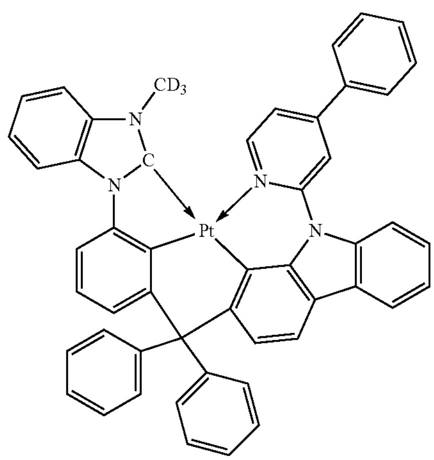
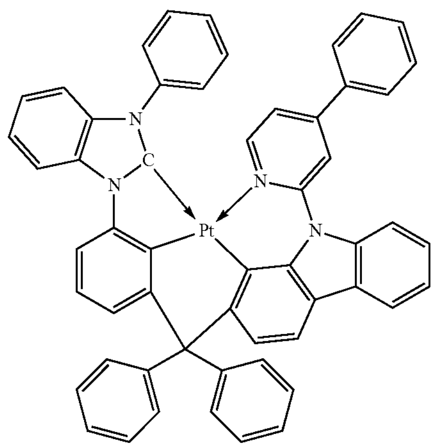
-continued
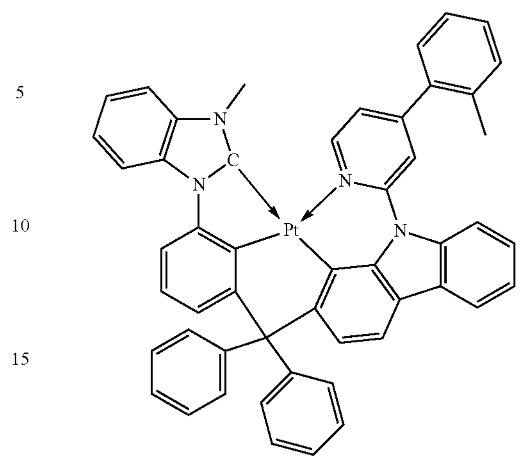
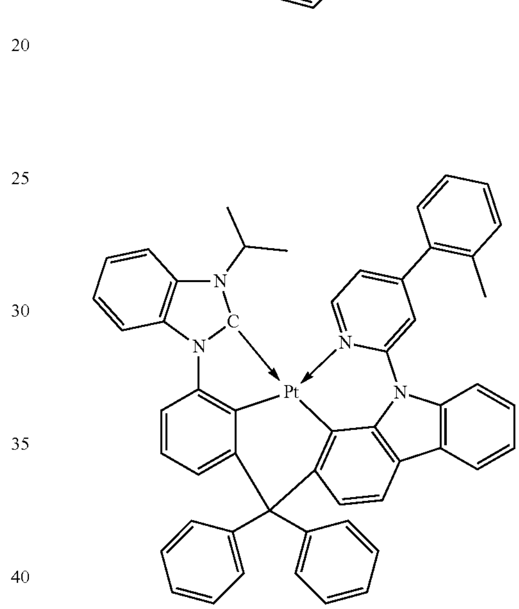
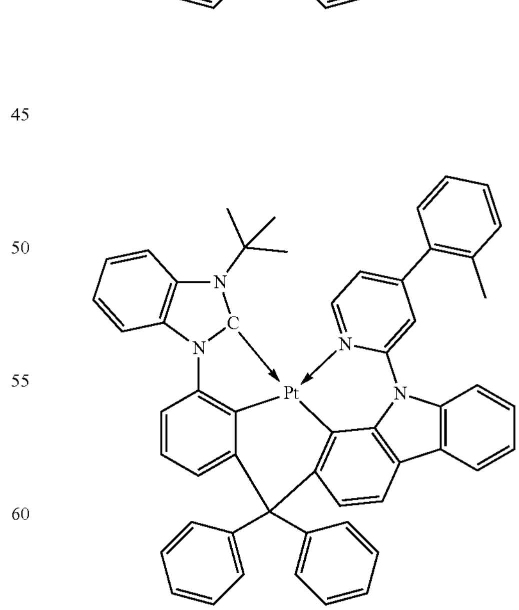

-continued
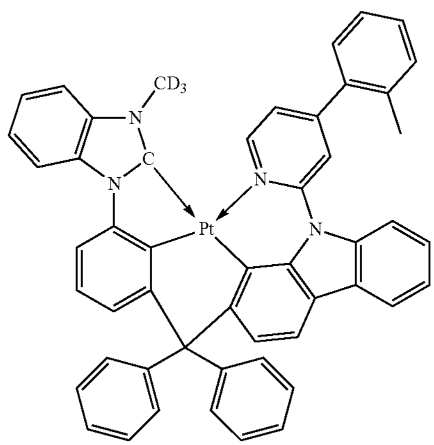
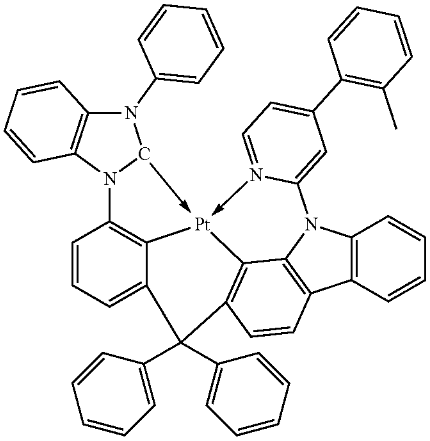
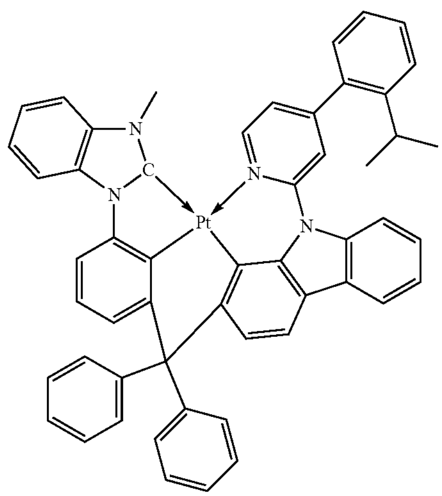
-continued
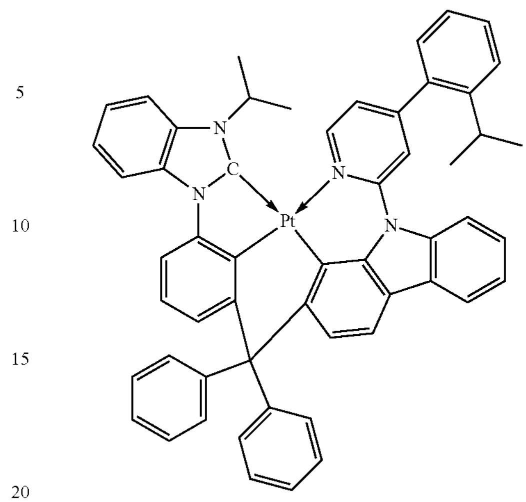
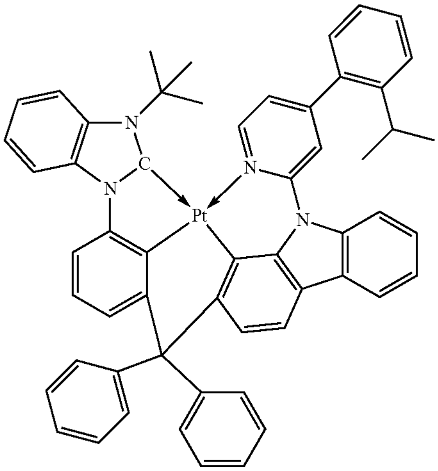
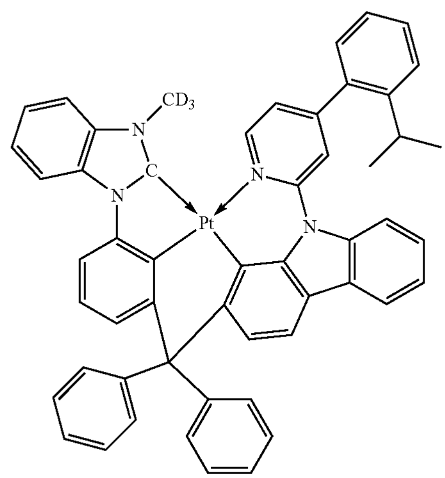

-continued
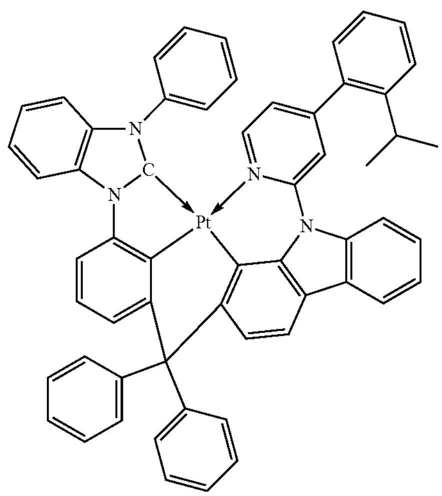
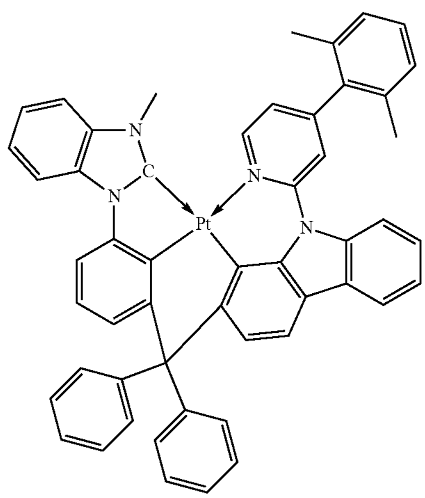
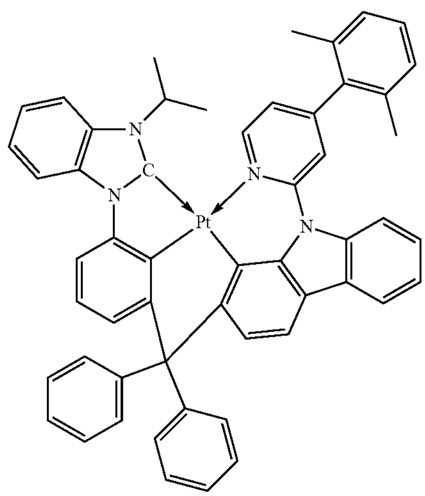
-continued
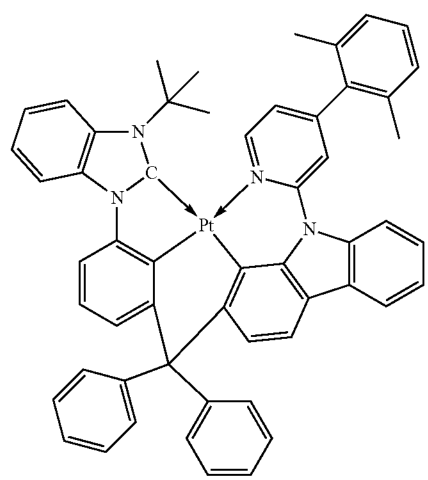
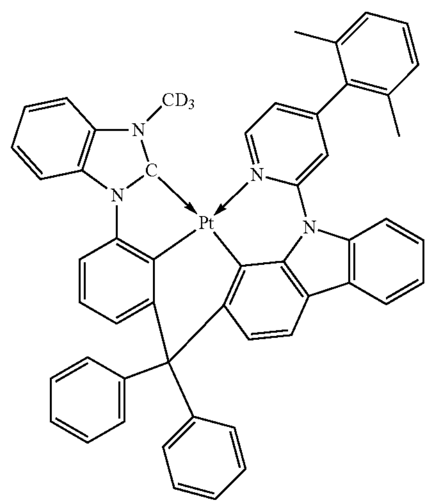
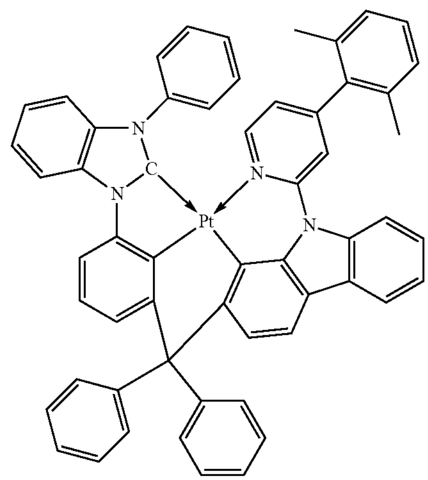

-continued
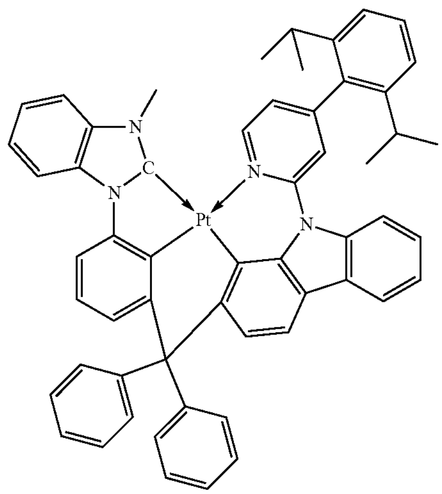
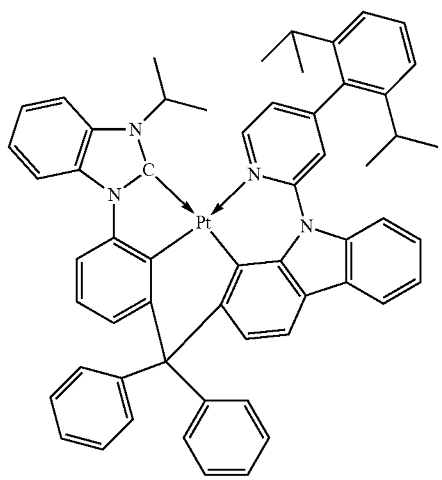
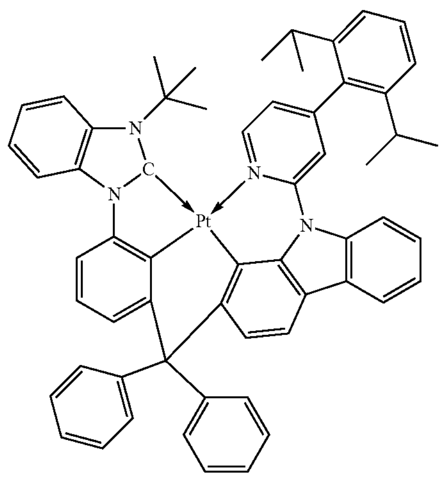
-continued
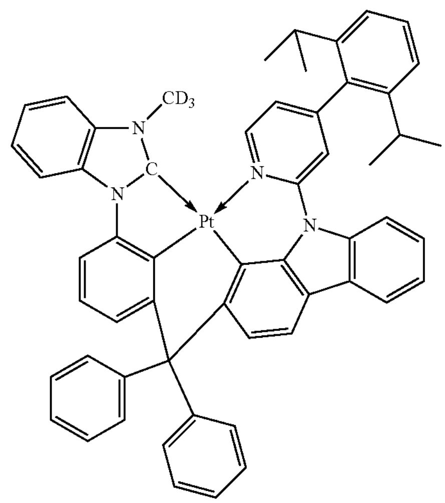
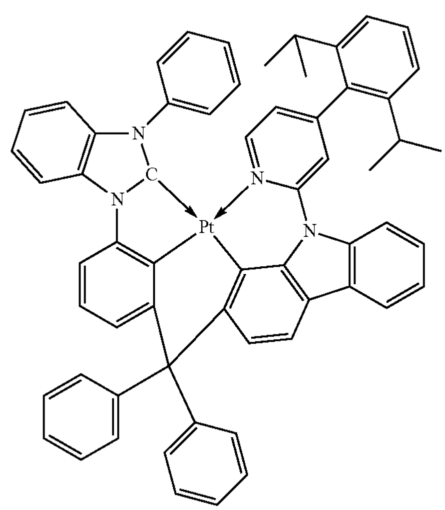
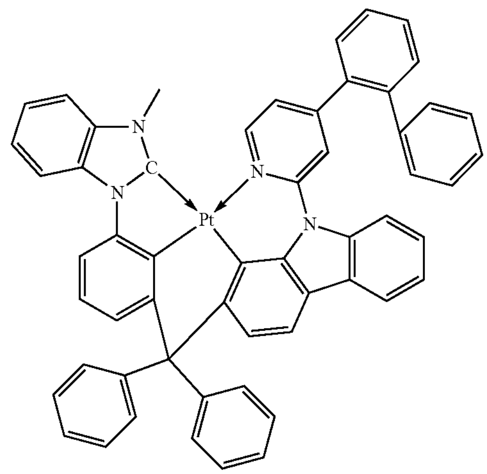

-continued
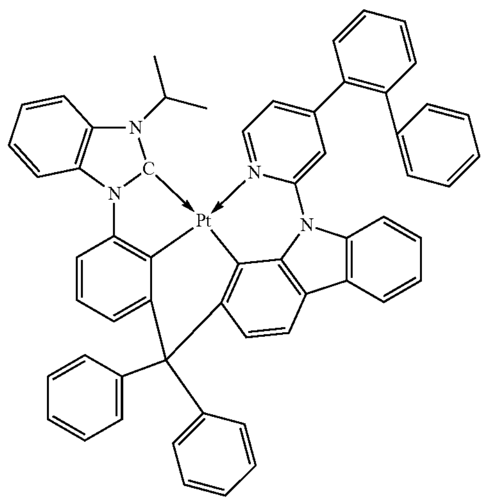
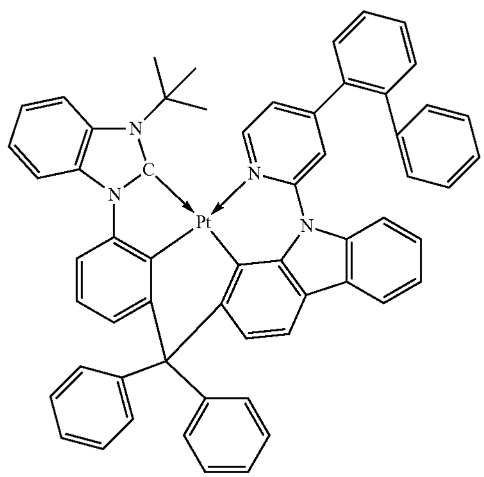
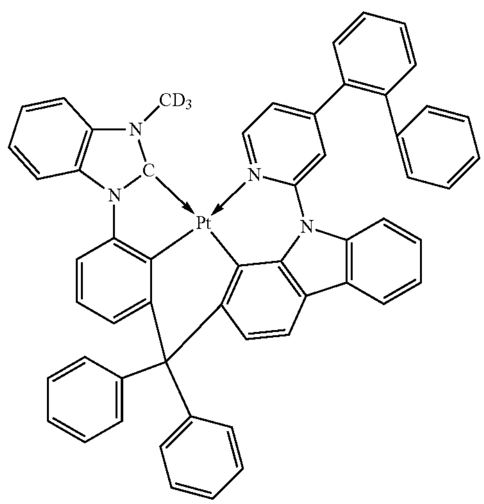
-continued
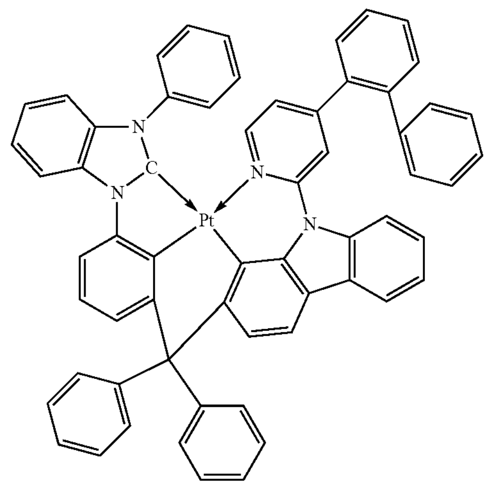
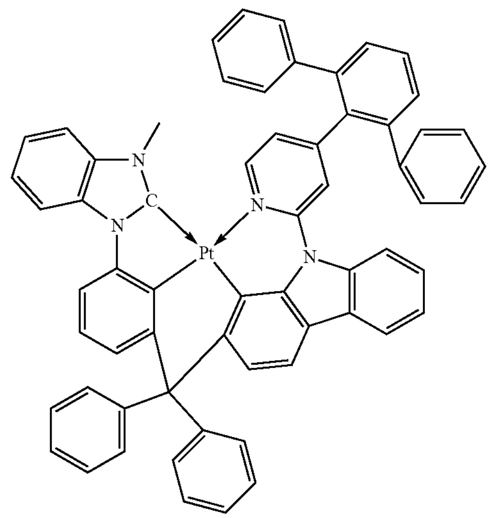
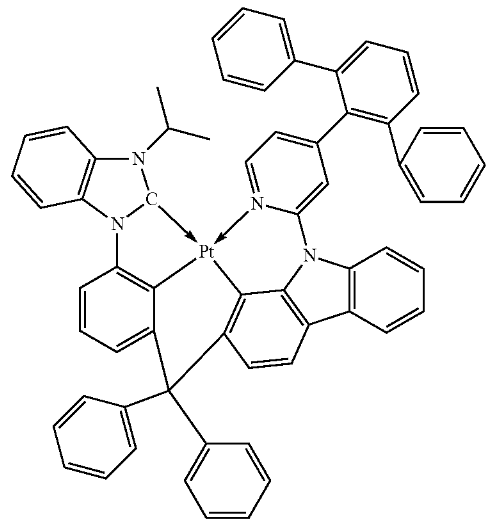

-continued
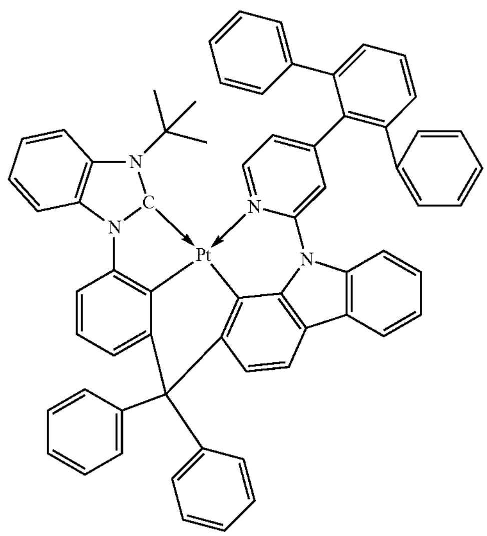
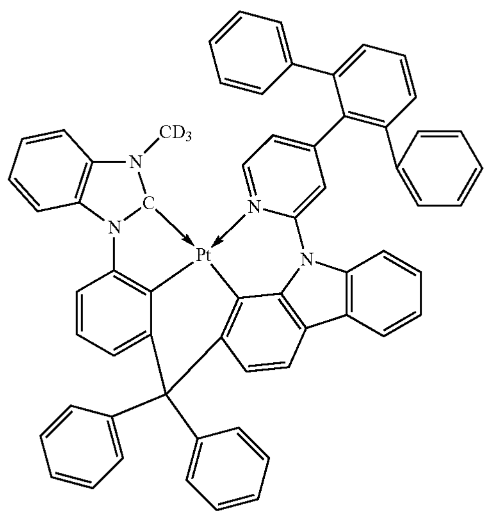
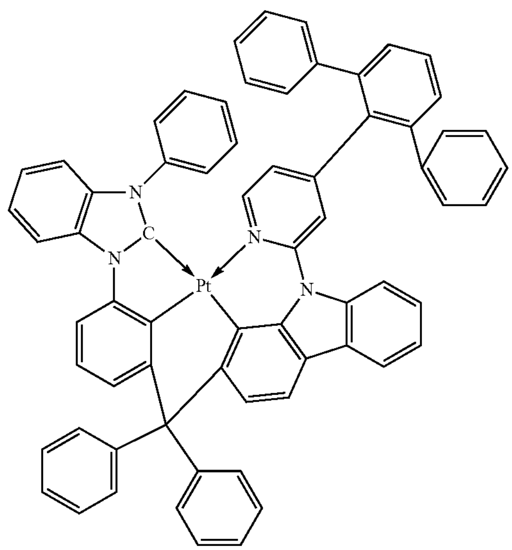
-continued
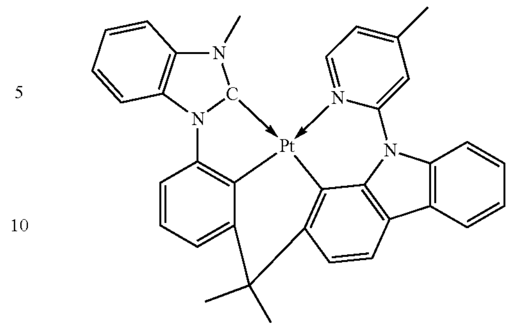
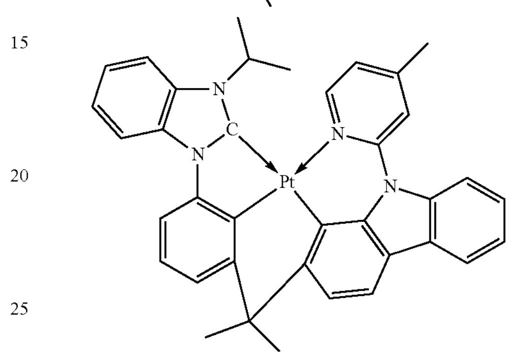
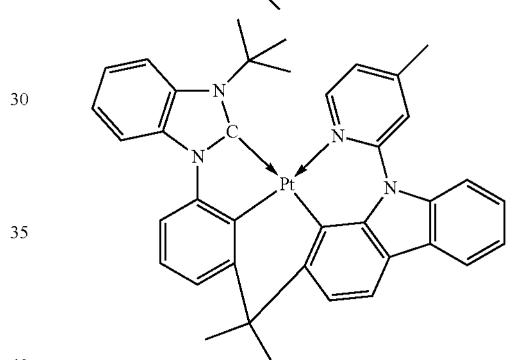
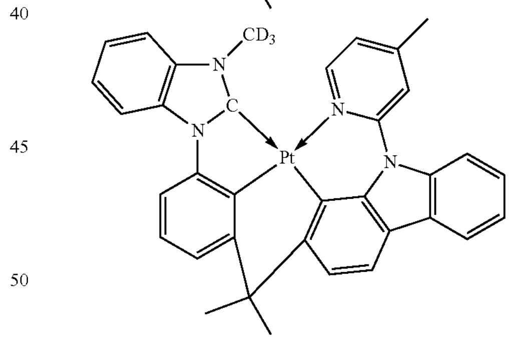
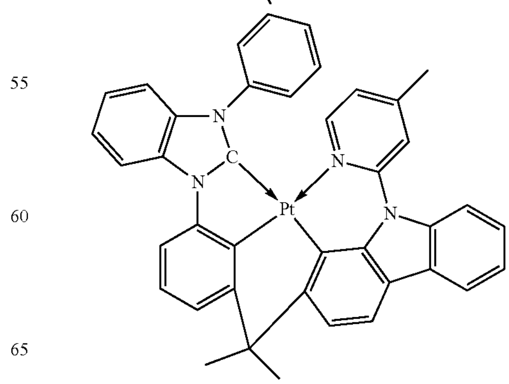

-continued
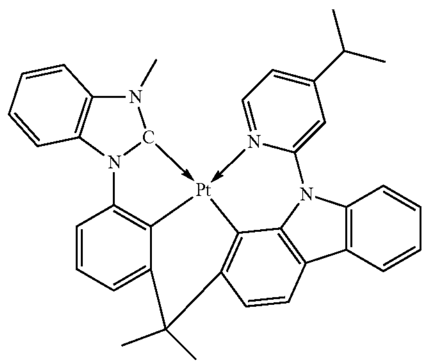
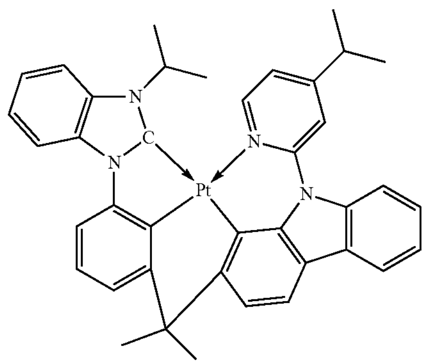
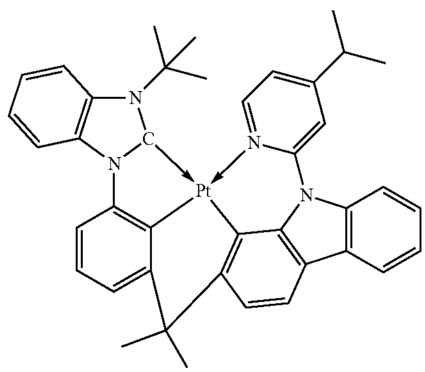
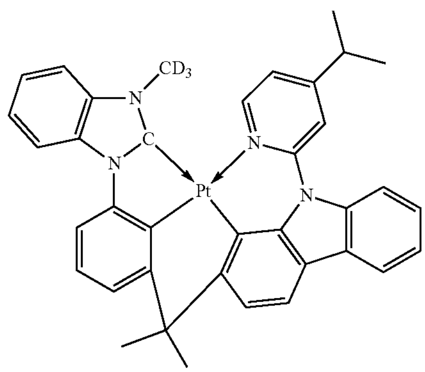
-continued
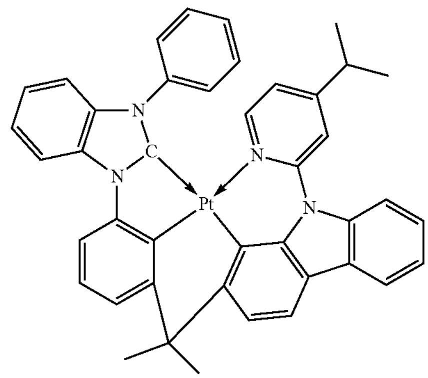
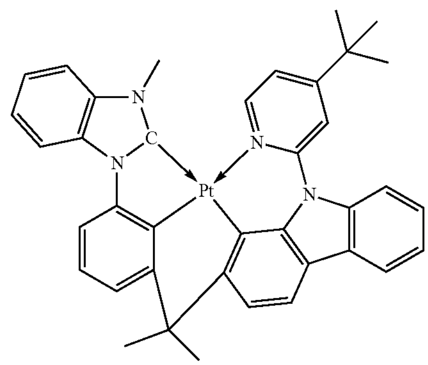
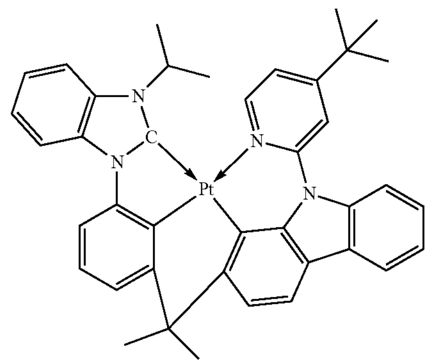
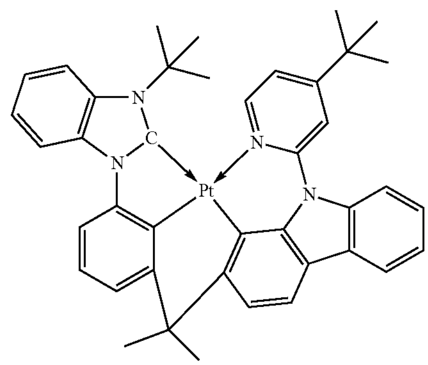

-continued
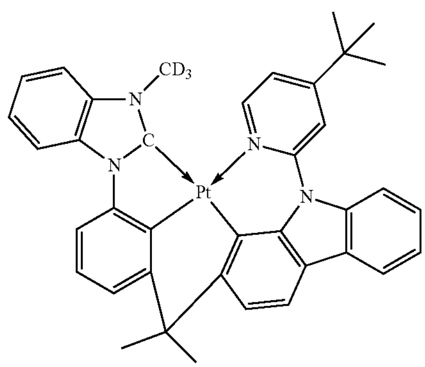
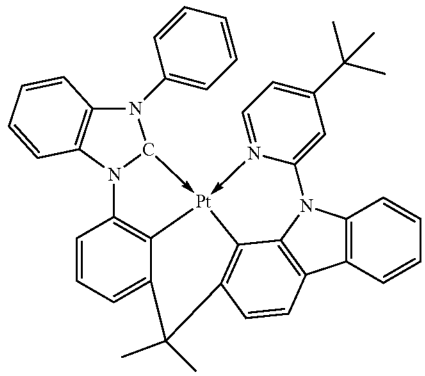
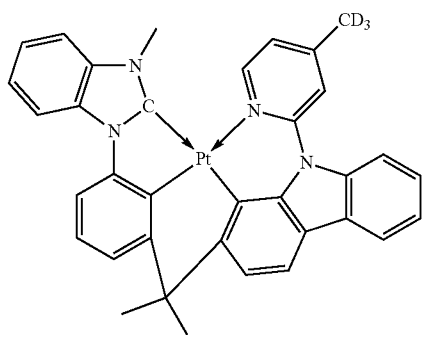
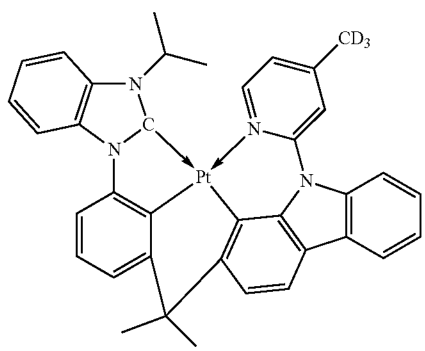
-continued
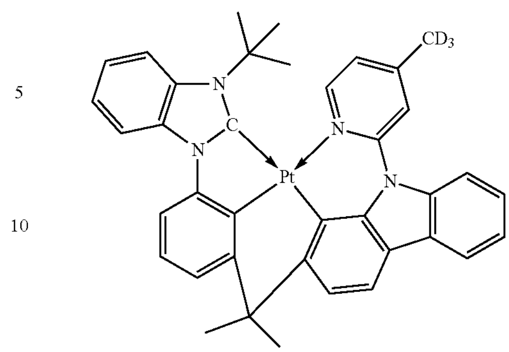
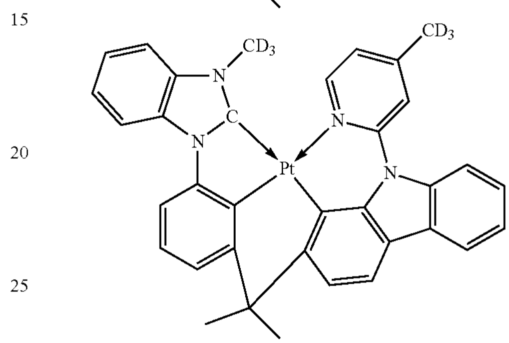
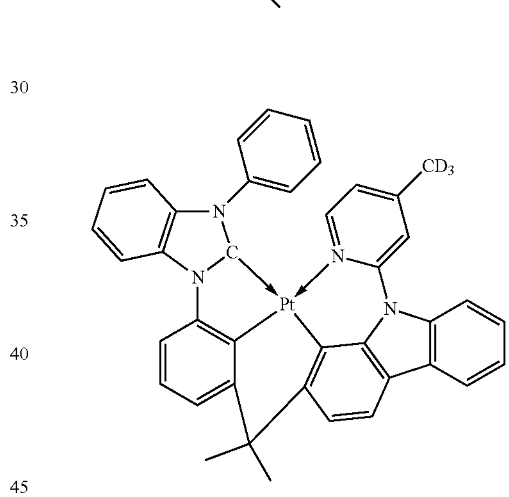
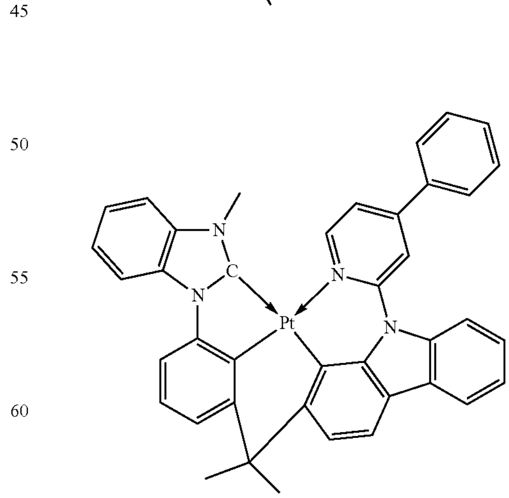
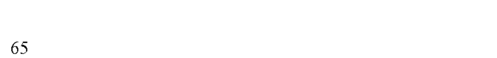

-continued
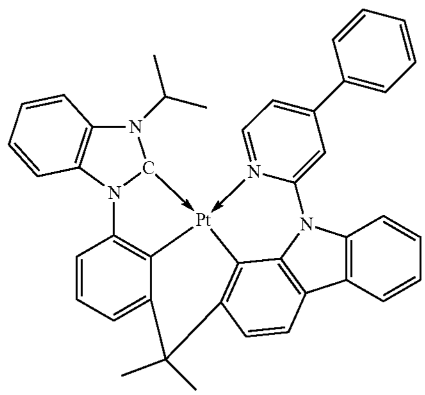
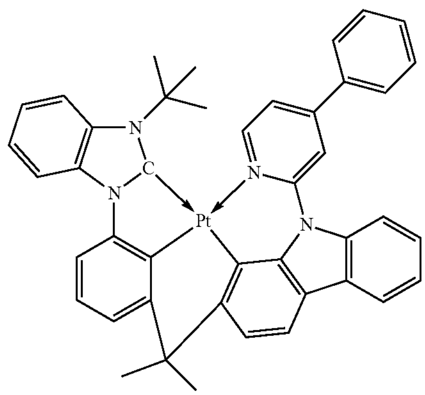
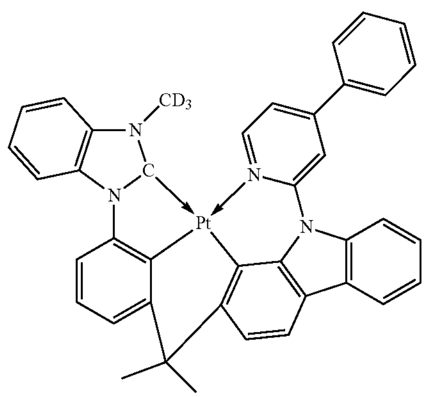
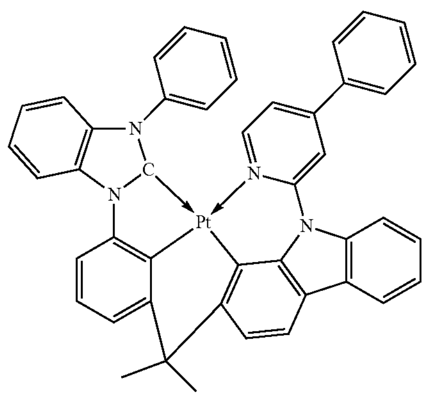
-continued
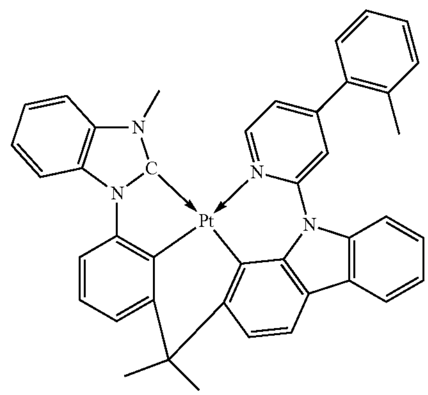
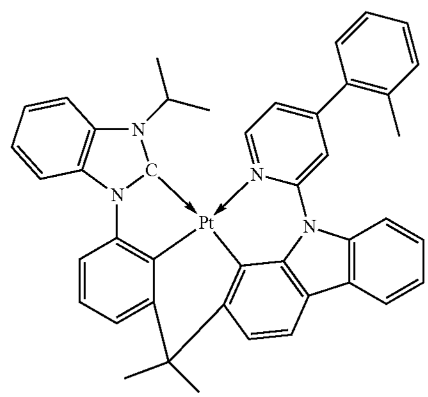
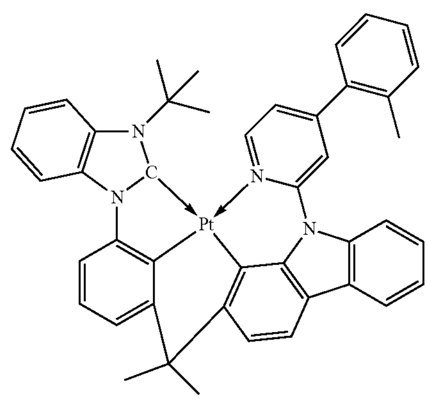
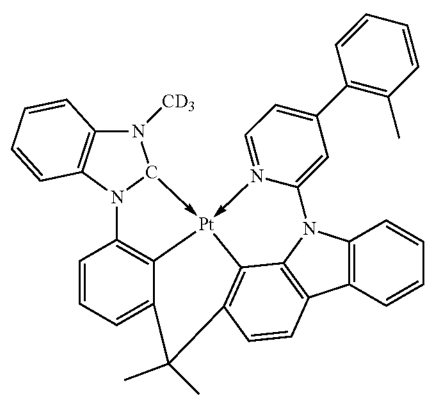

-continued
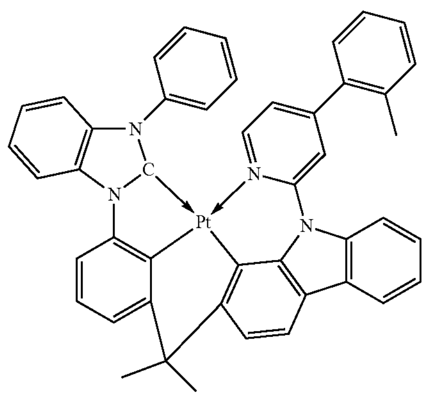
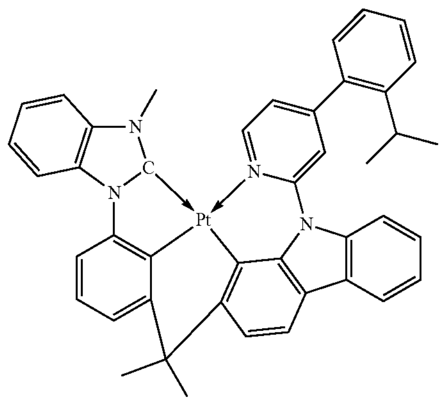
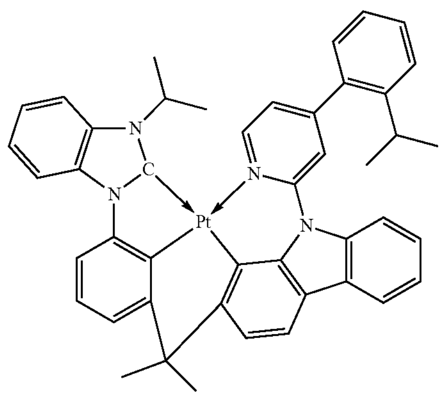
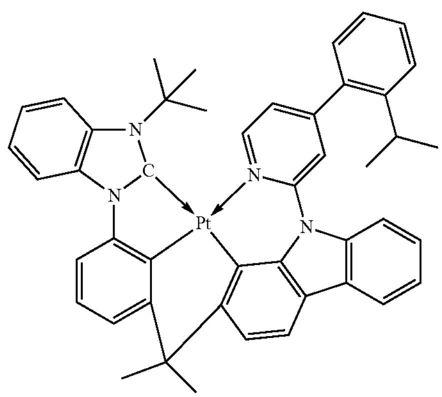
-continued
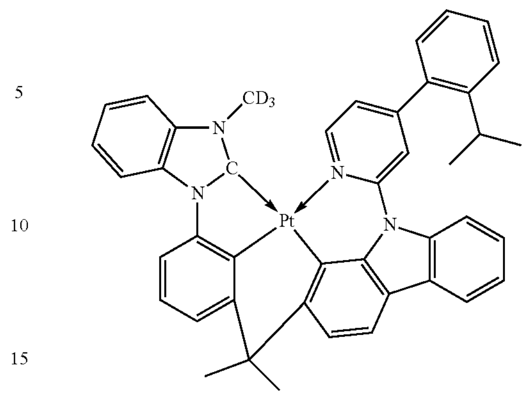
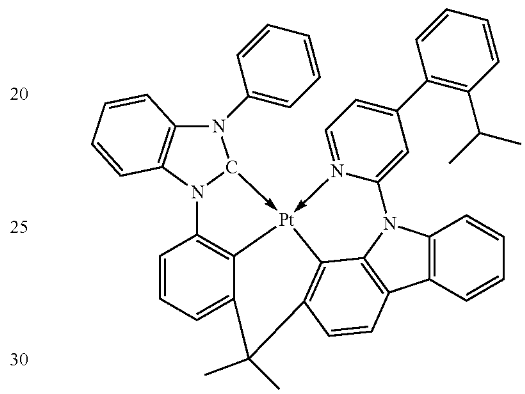
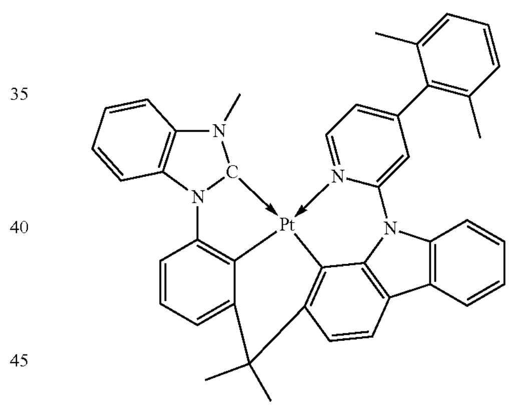
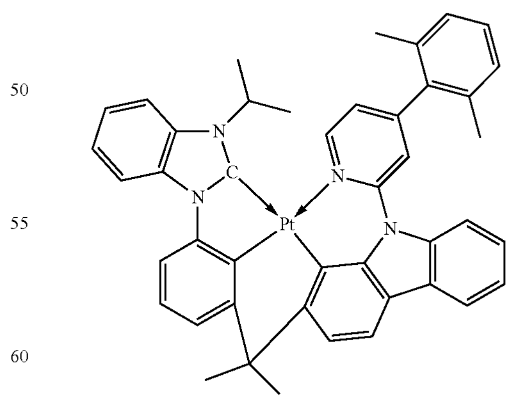
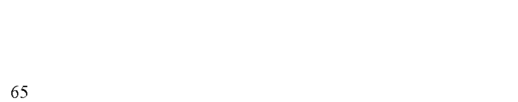

-continued
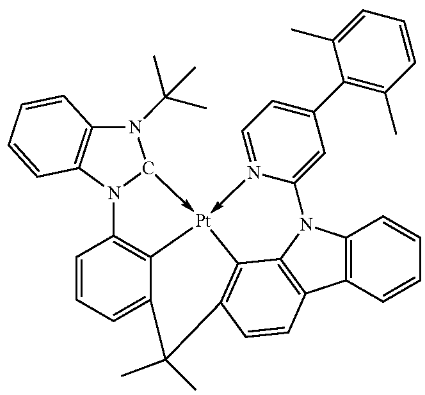
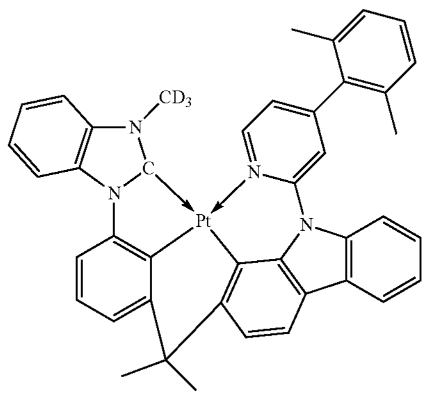
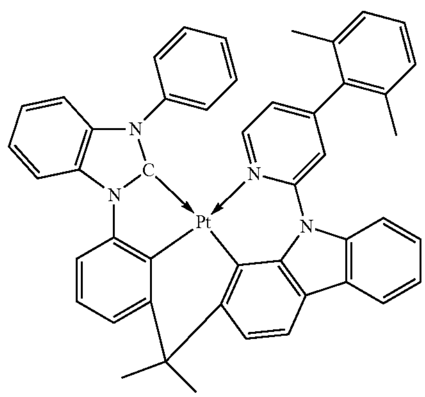
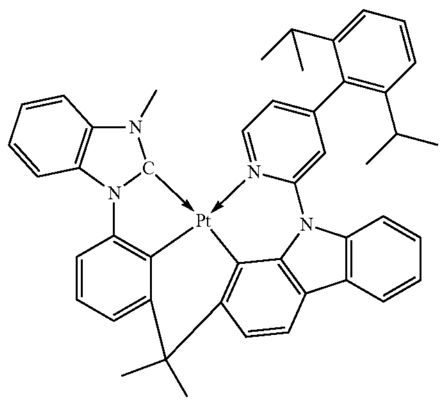
-continued
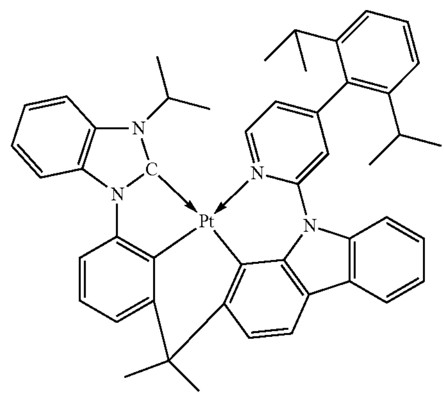
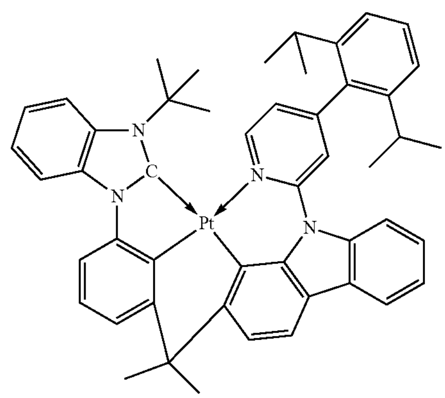
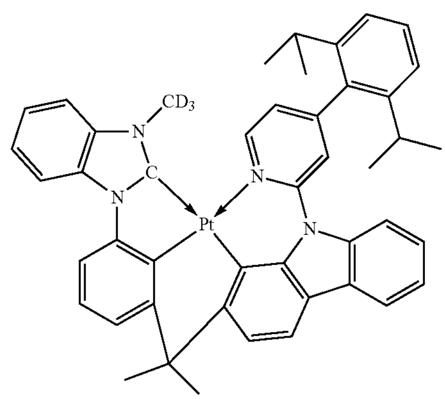
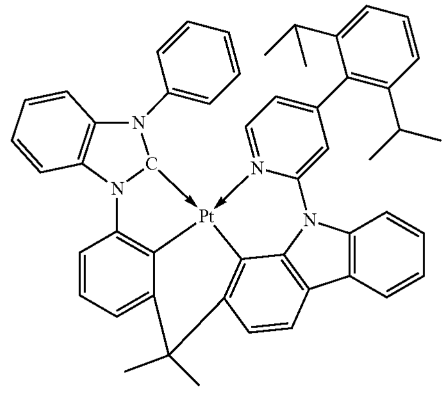

-continued
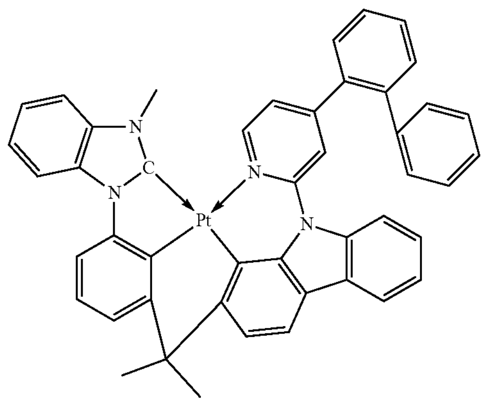
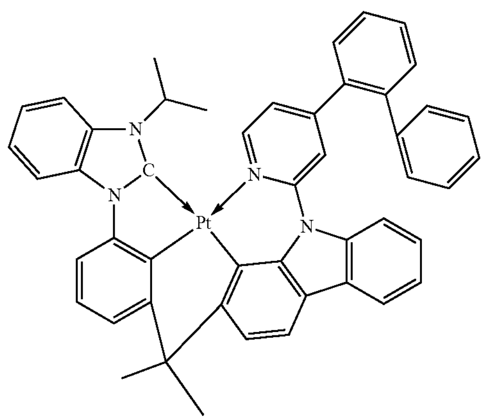
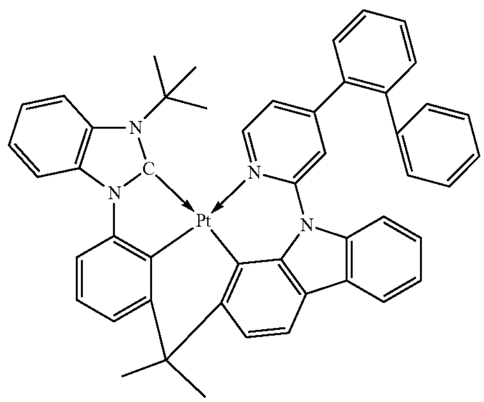
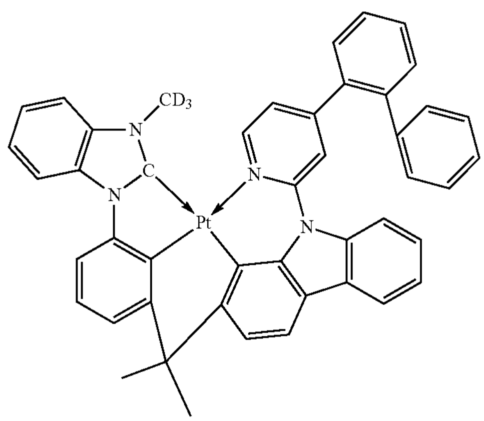
-continued
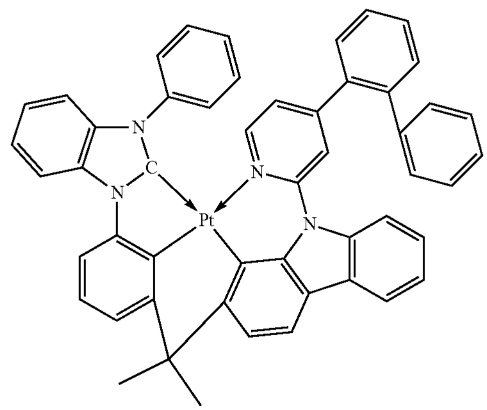
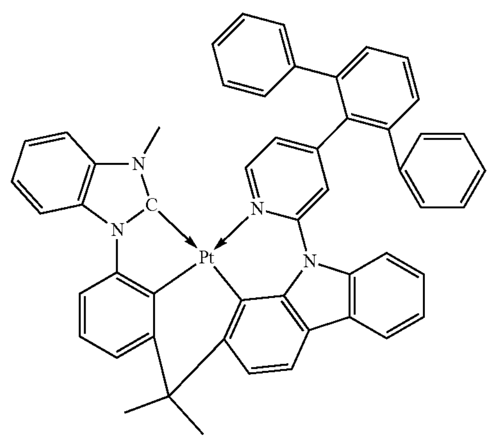
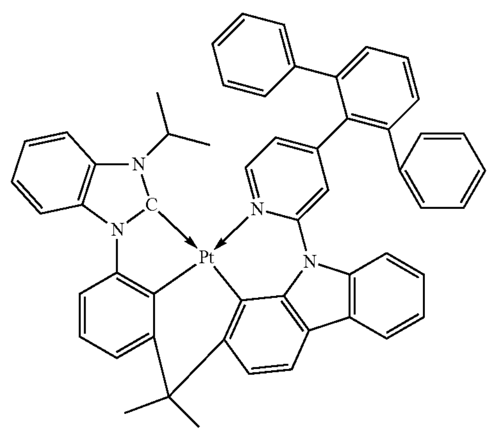
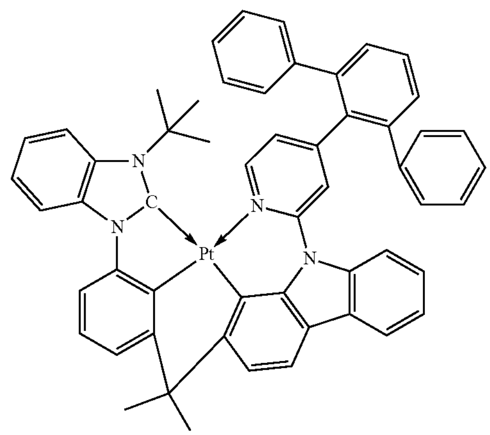

-continued
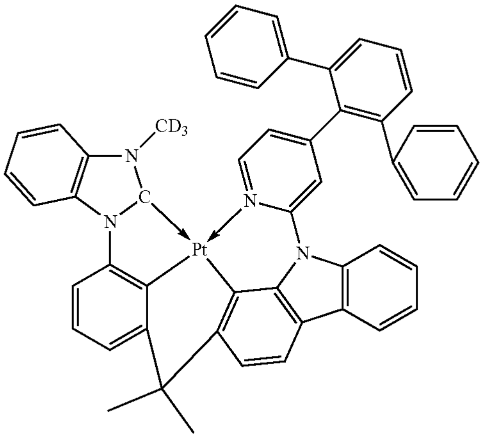
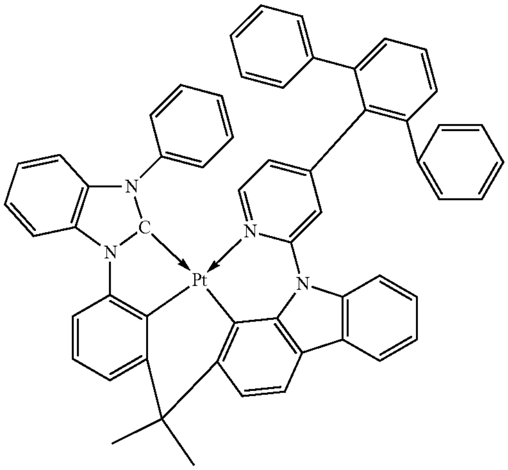
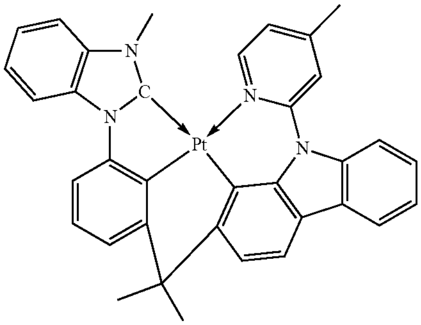
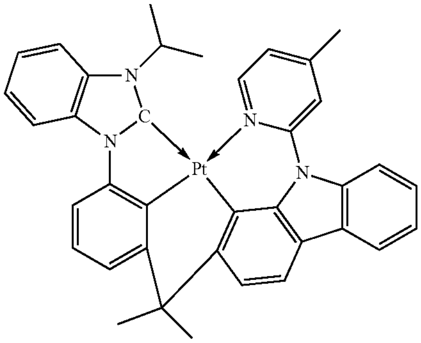
-continued
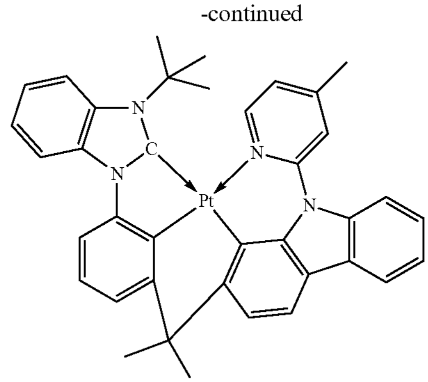
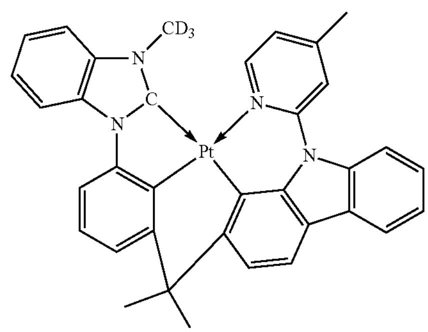
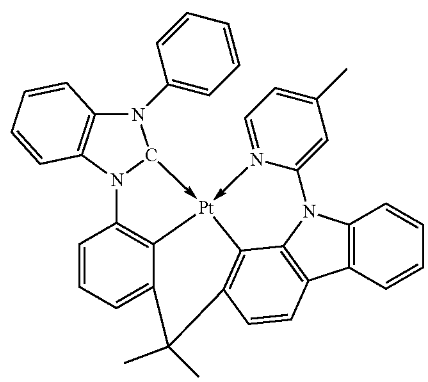
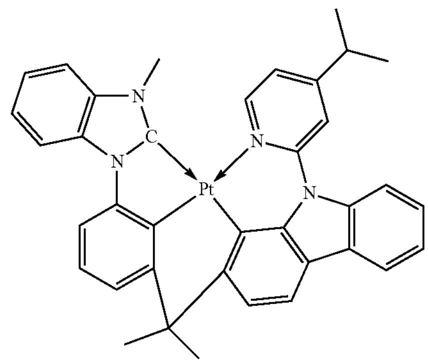

-continued
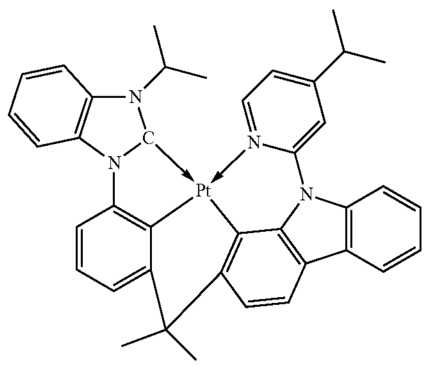
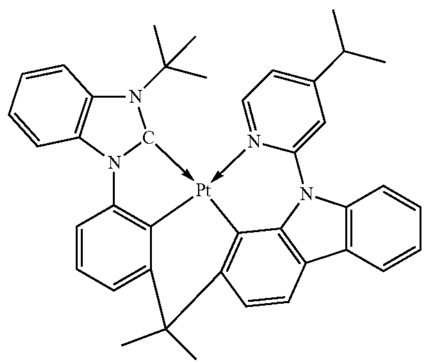
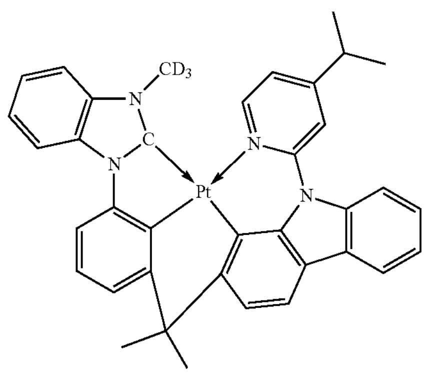
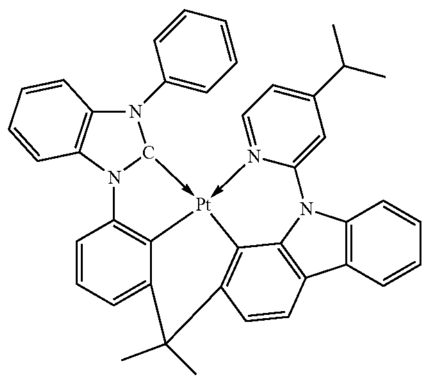
-continued
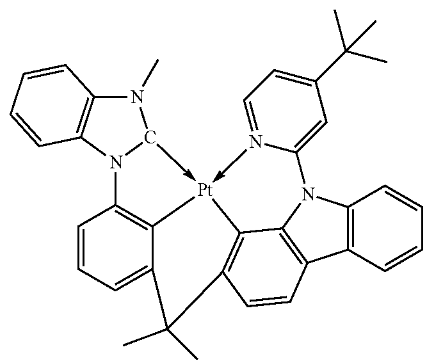
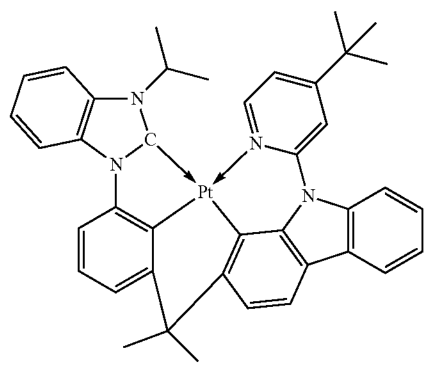
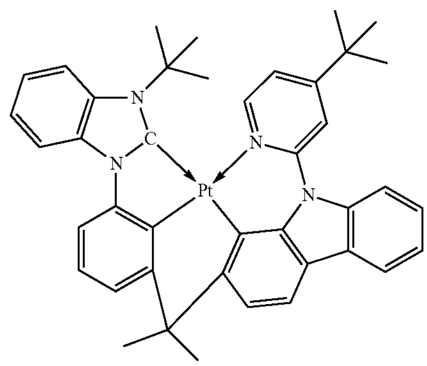
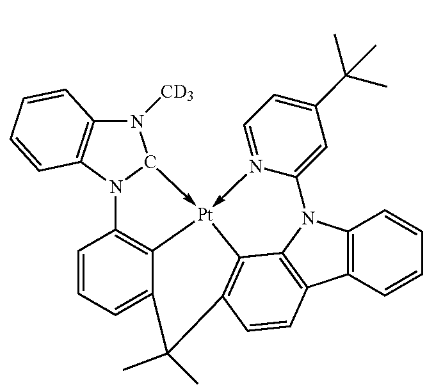

-continued
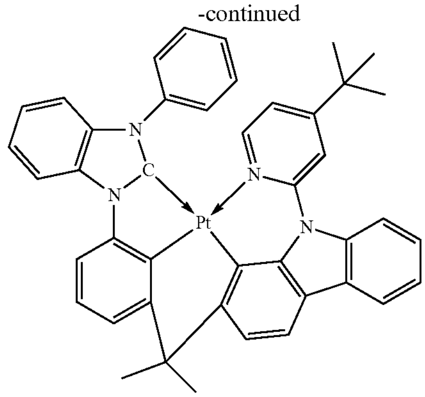
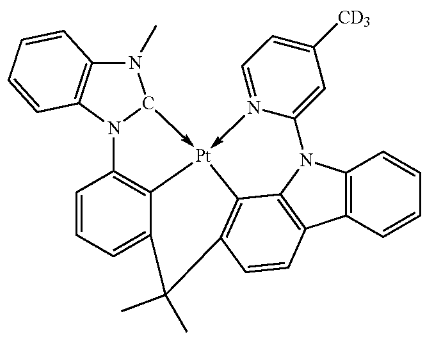
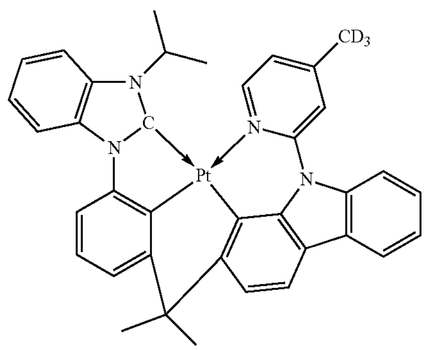
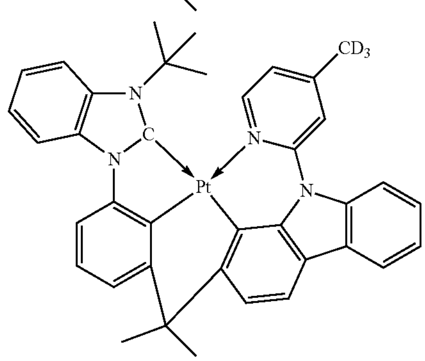
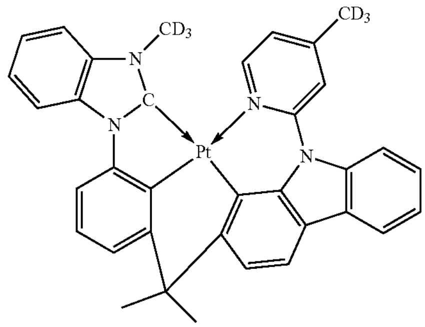
-continued
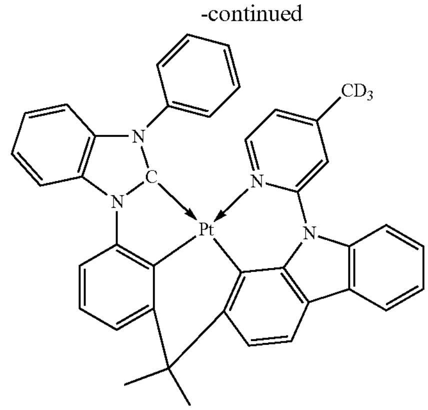
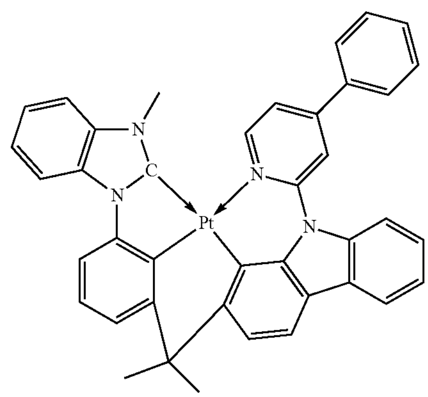
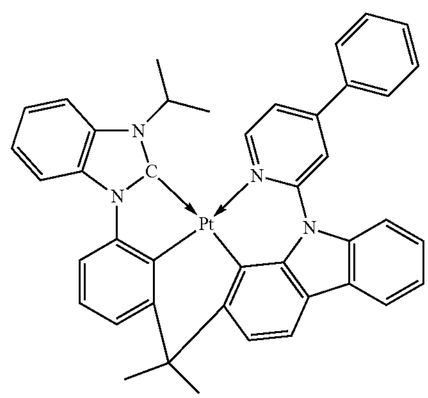
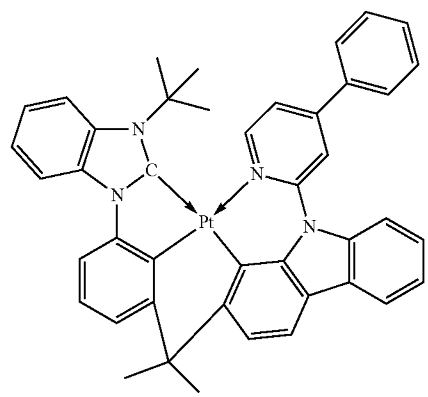

-continued
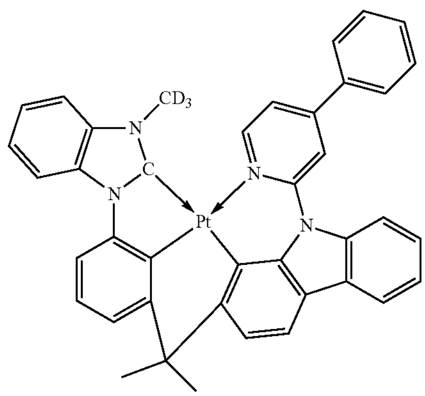
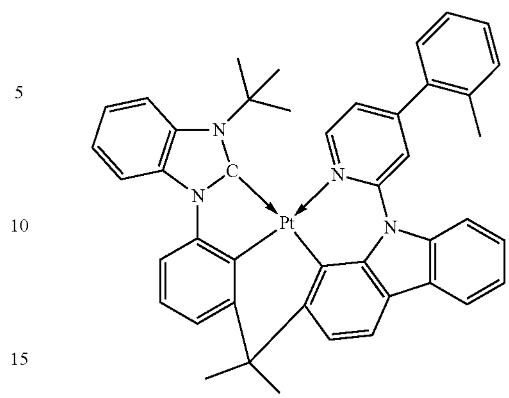
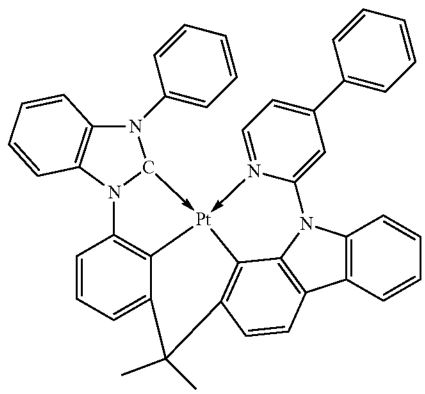
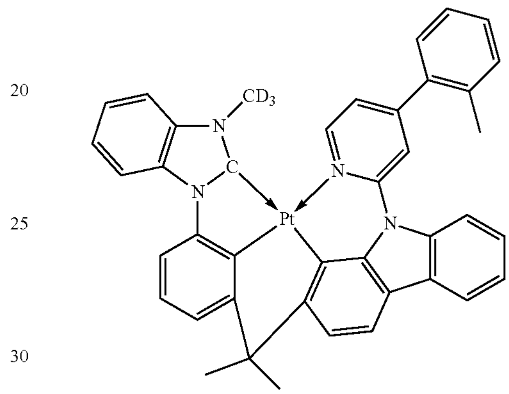
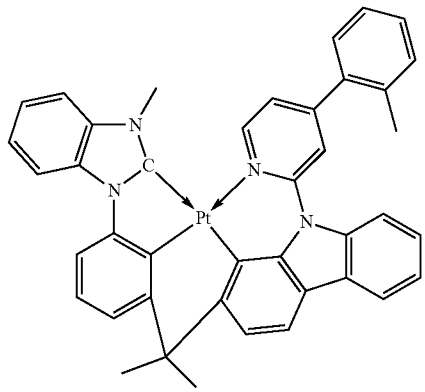
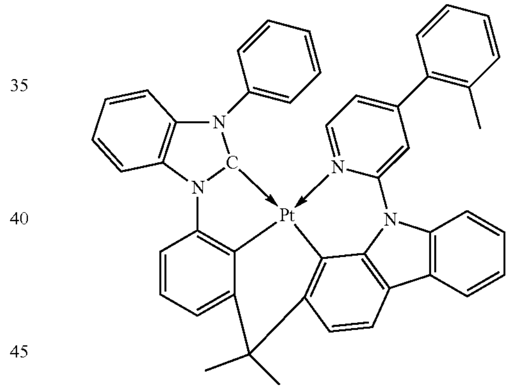
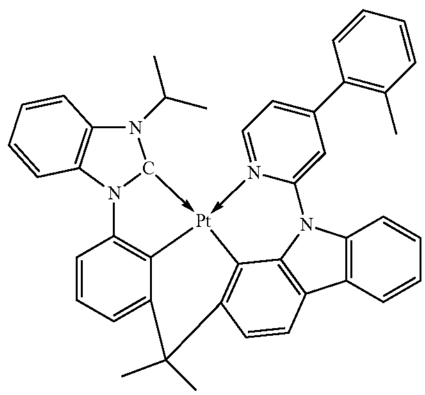
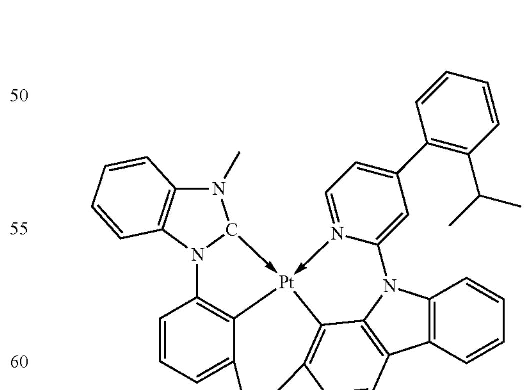
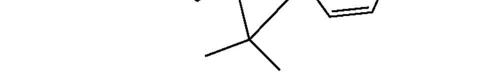
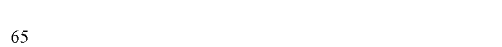

-continued
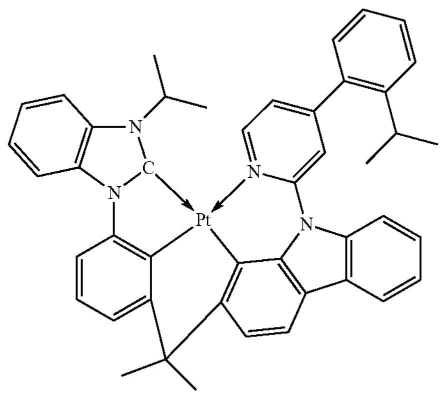
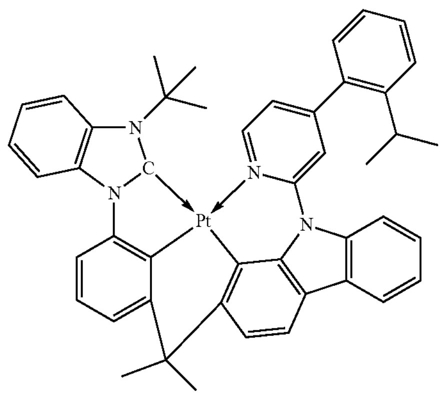
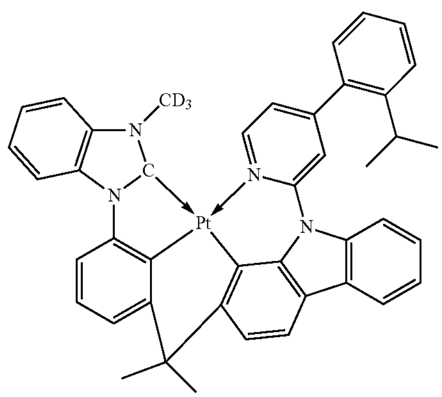
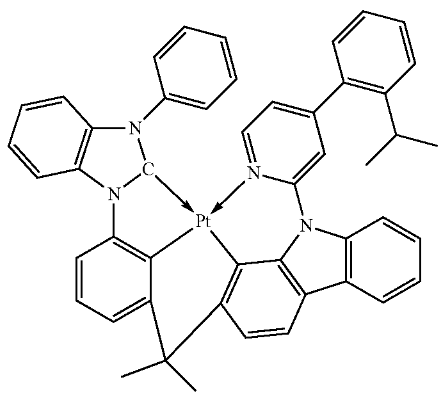
-continued
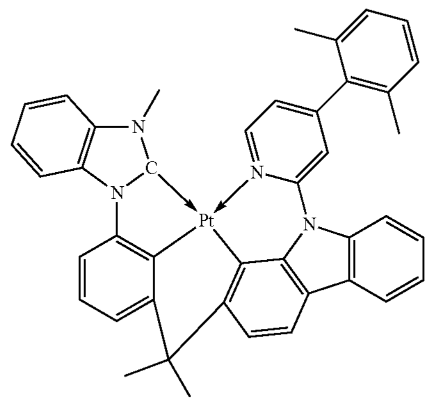
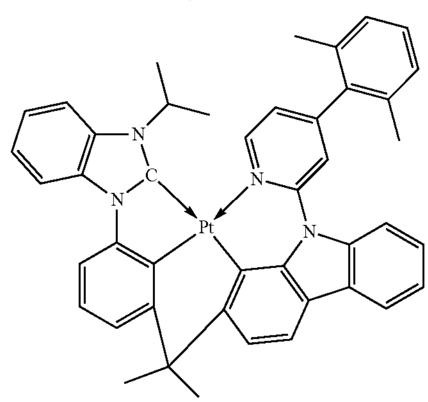
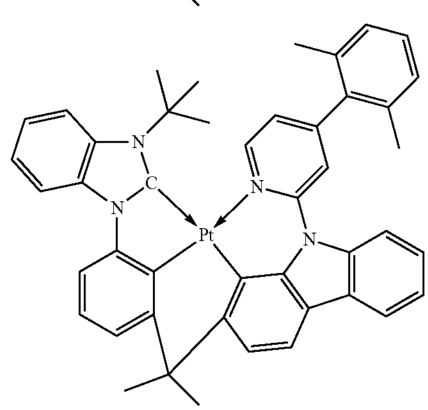
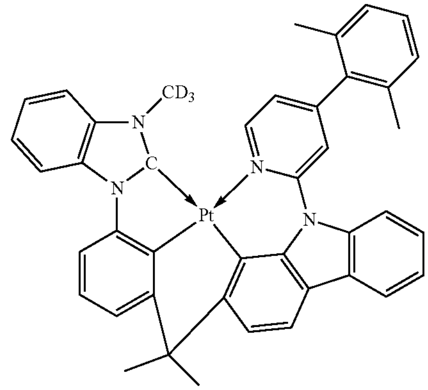

-continued
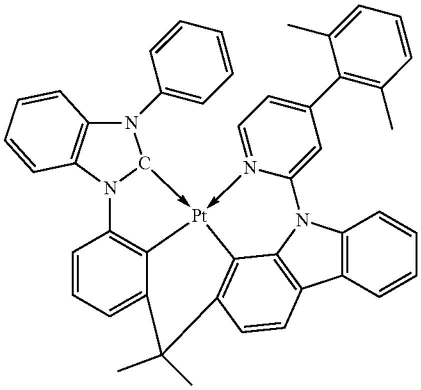
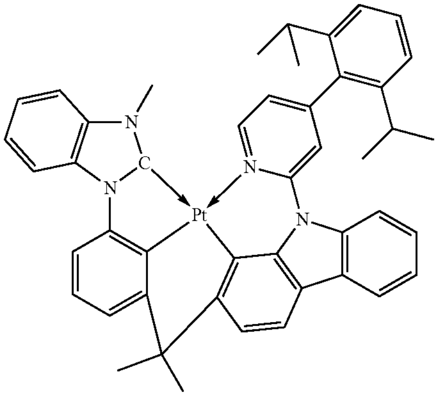
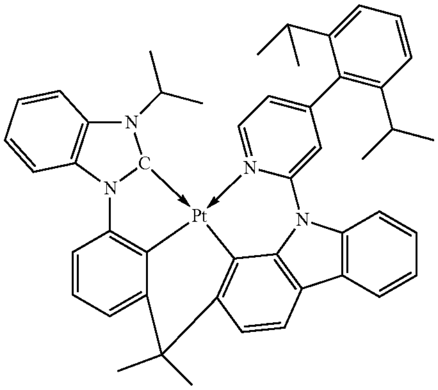
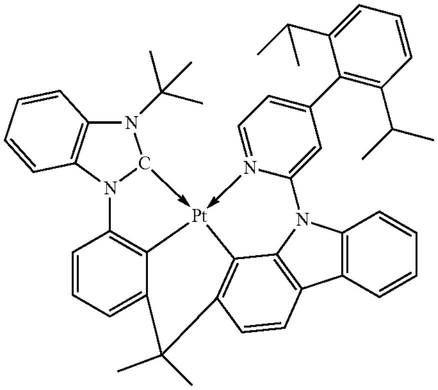
-continued
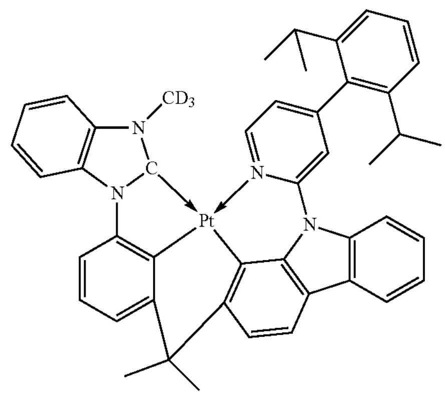
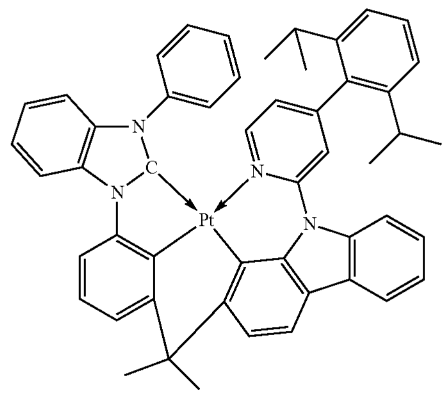
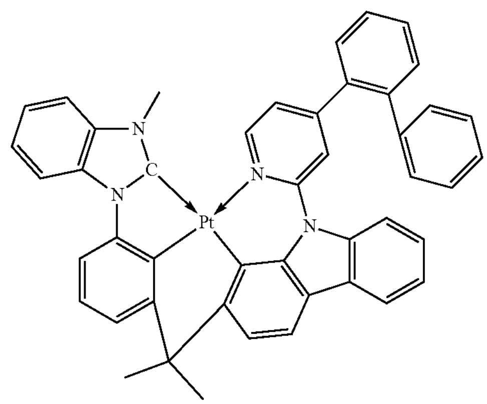
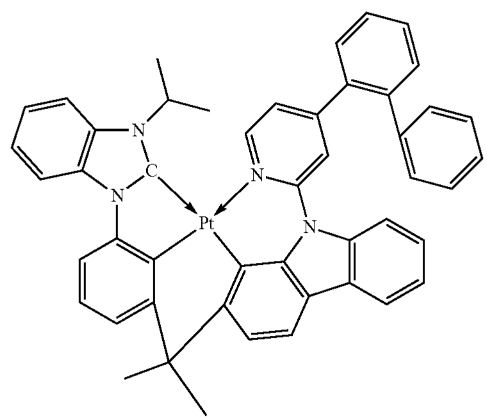

-continued
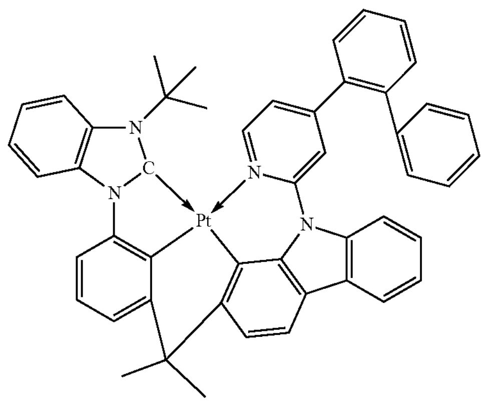
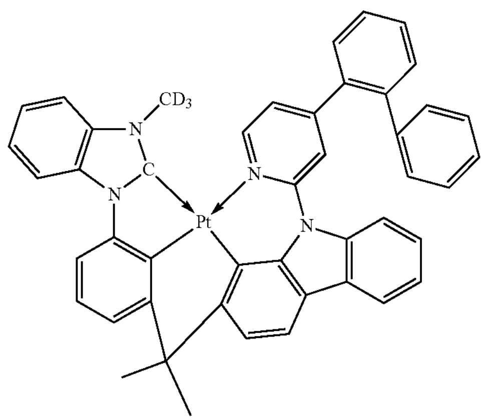
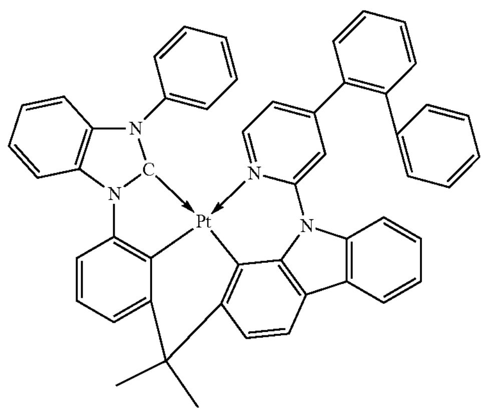
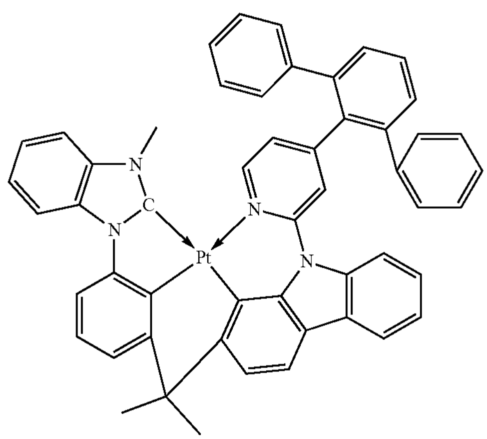
-continued
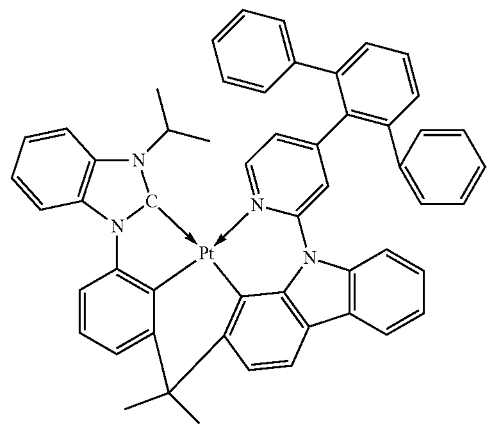
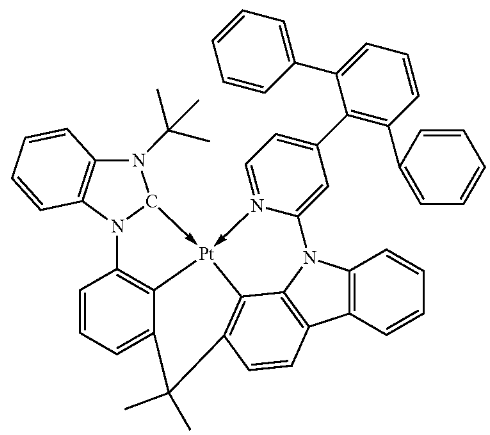
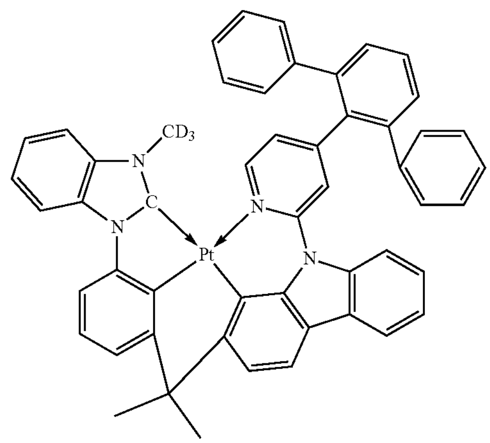

-continued
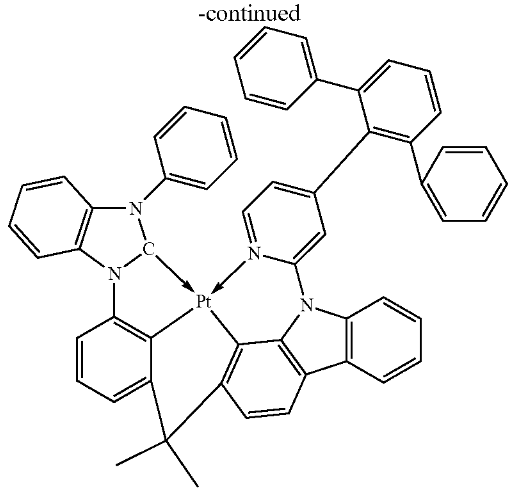
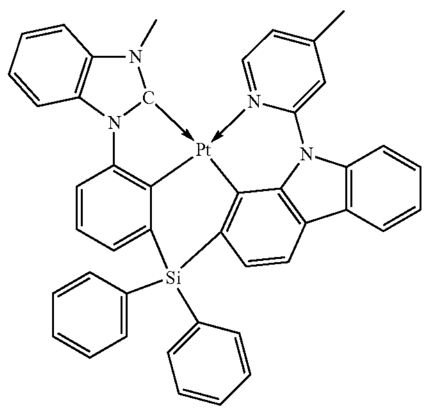
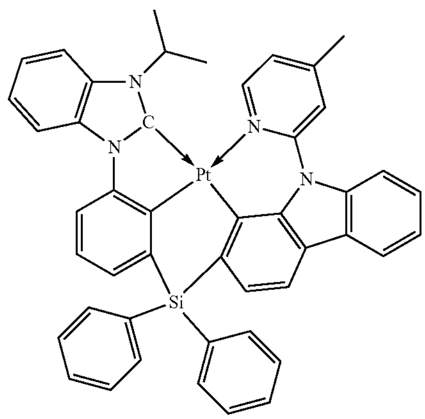
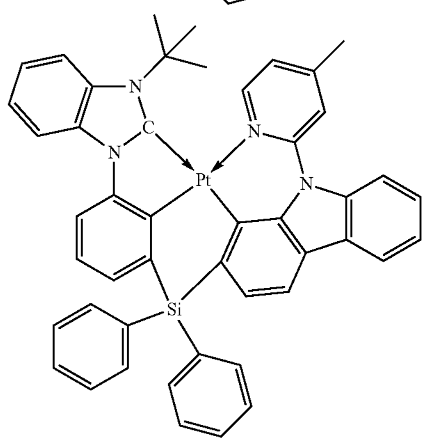
-continued
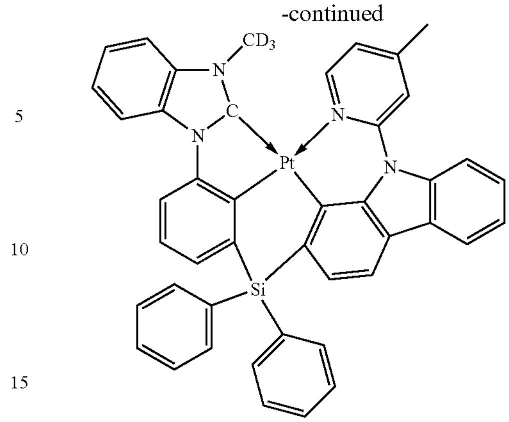
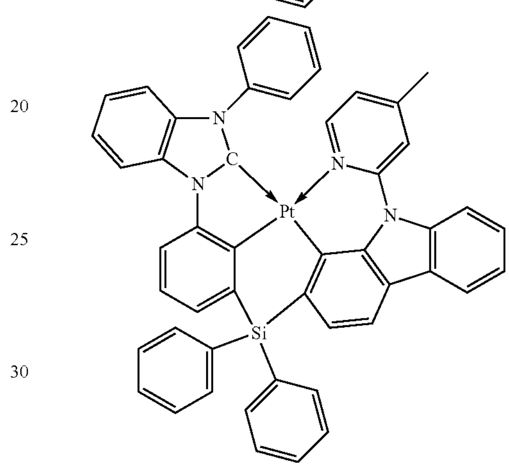
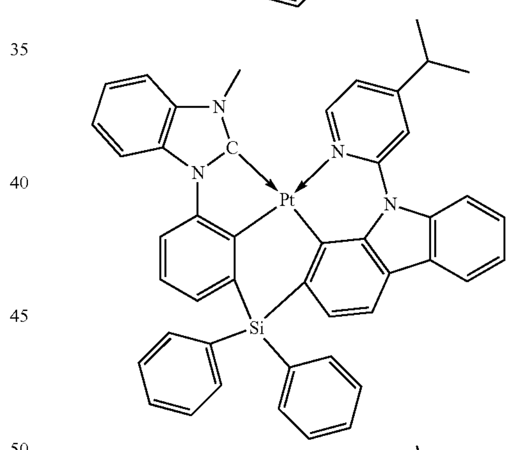
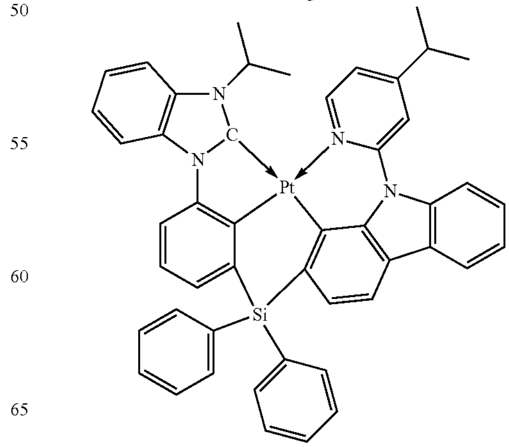

-continued
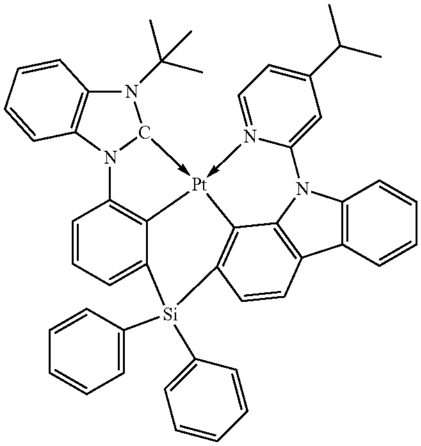
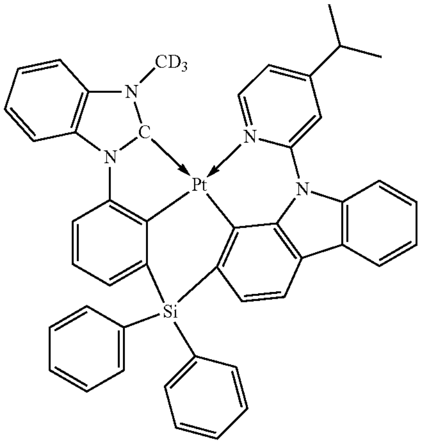
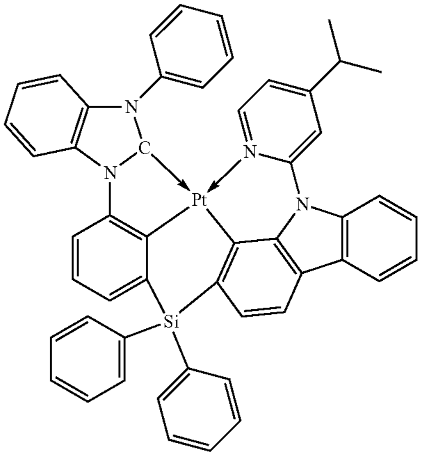
-continued
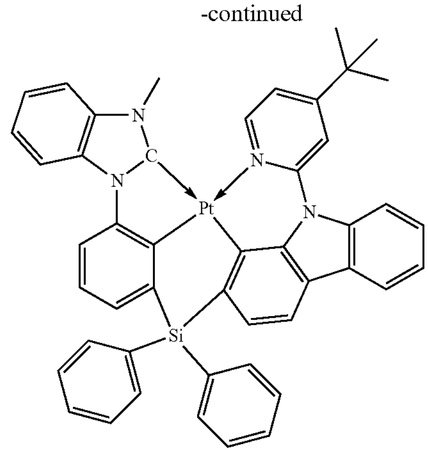
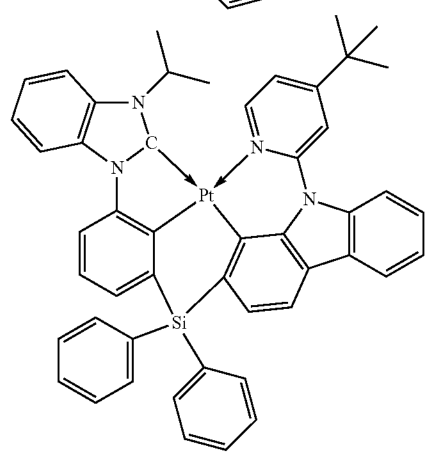
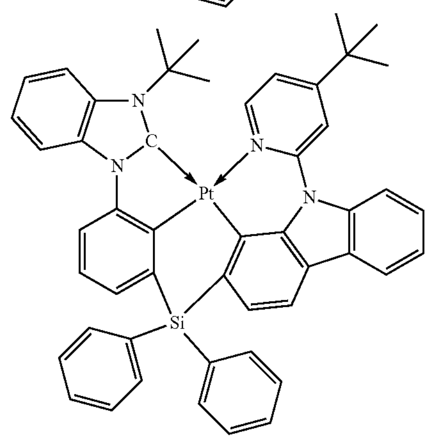
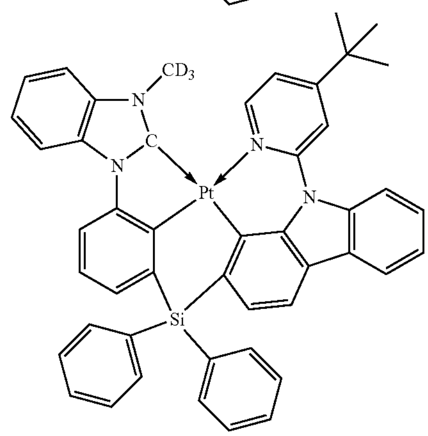

-continued
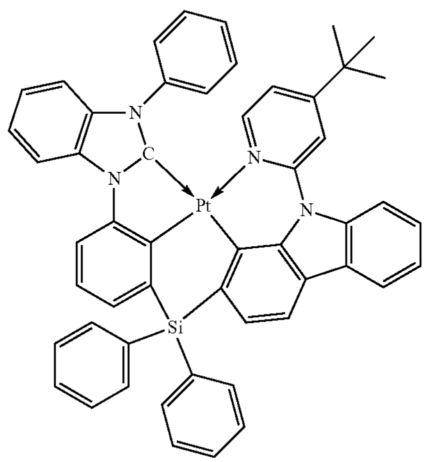
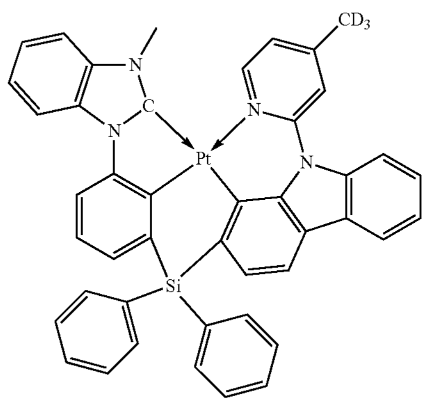
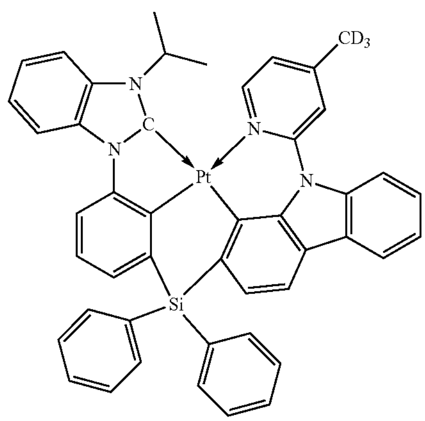
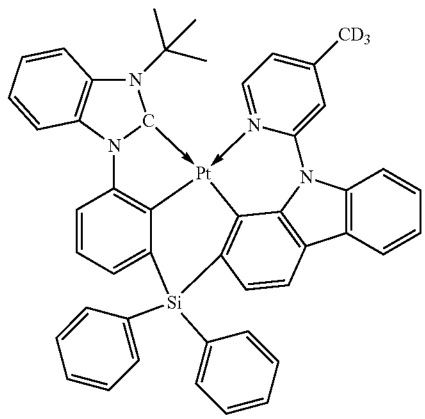
-continued
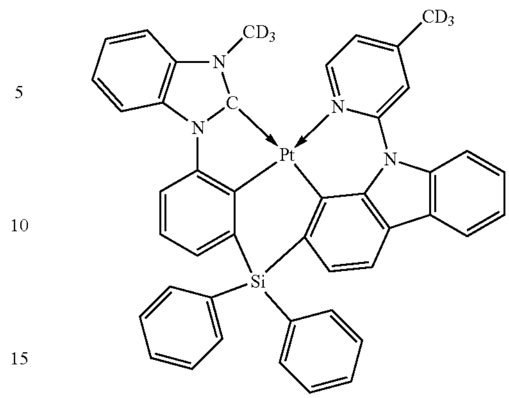
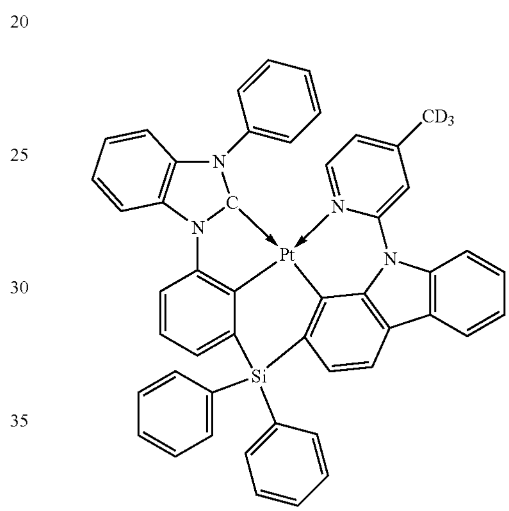
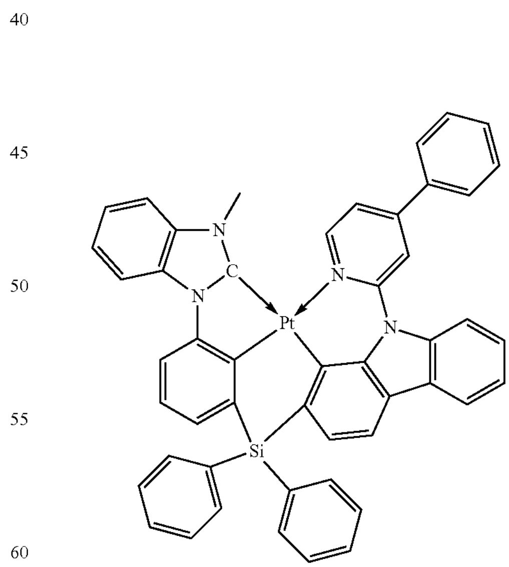

-continued
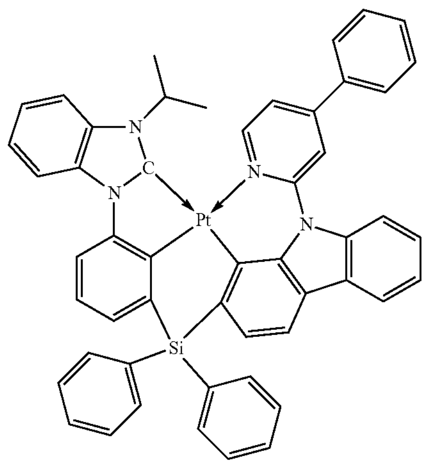
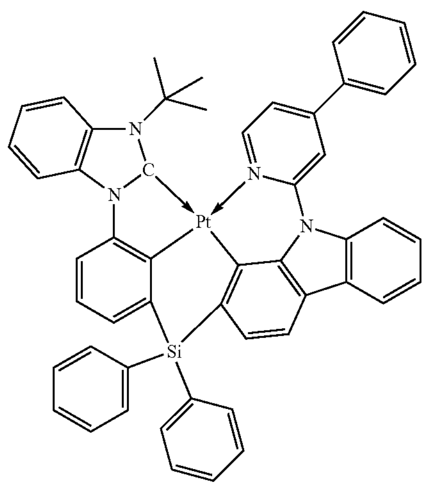
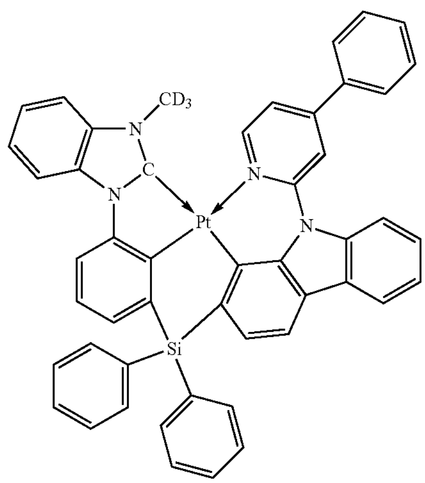
-continued
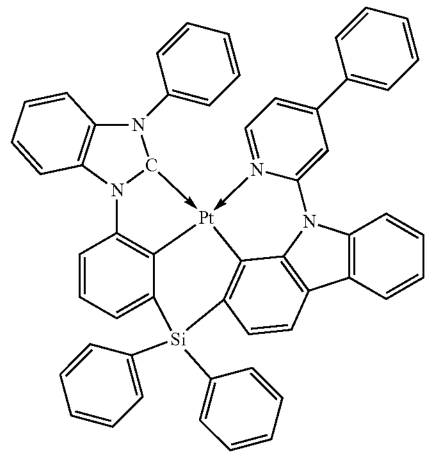
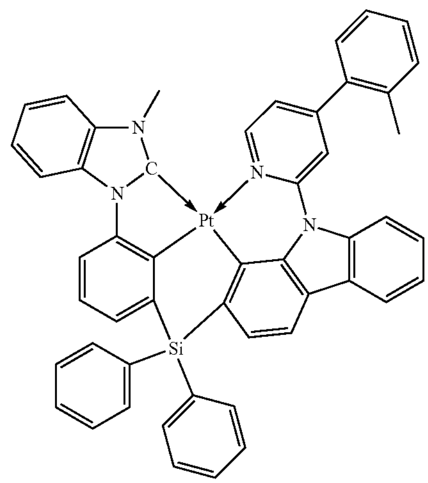
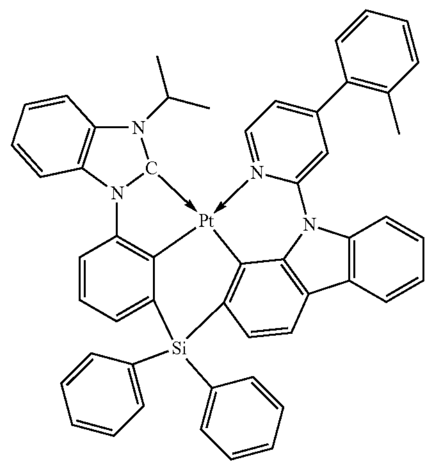

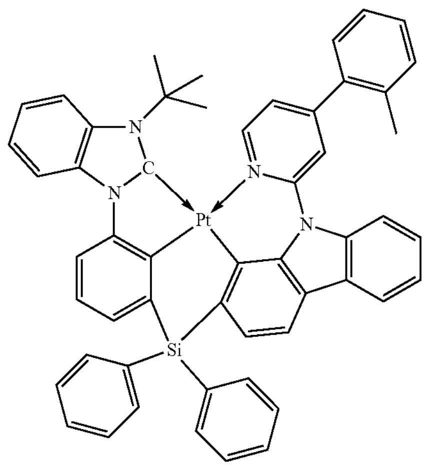
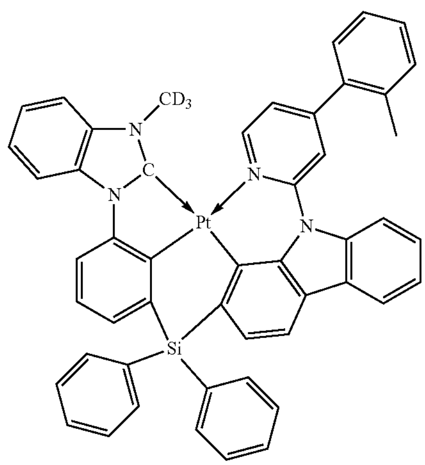
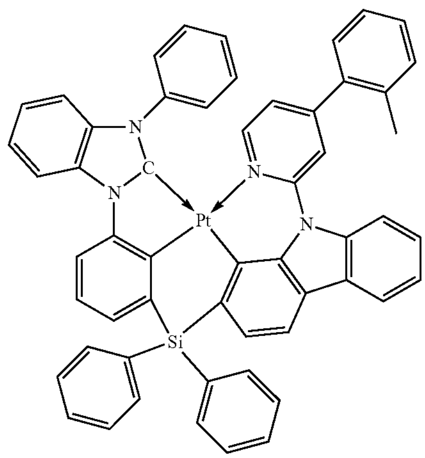
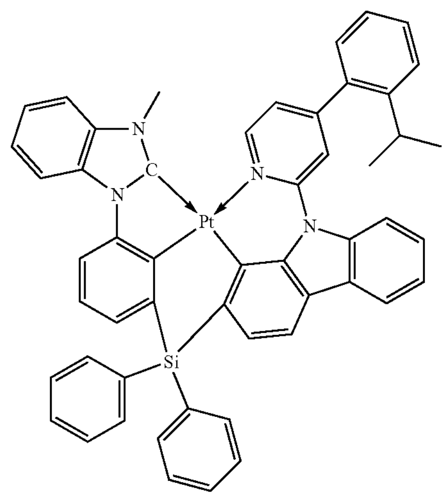
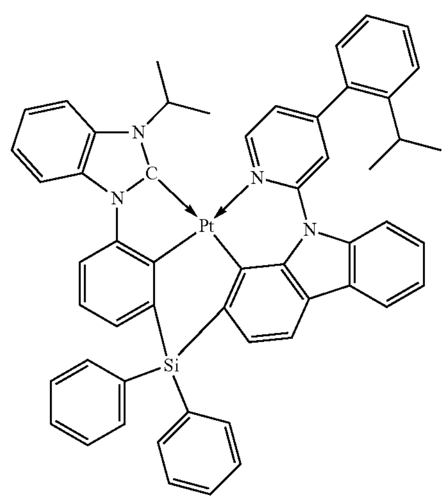
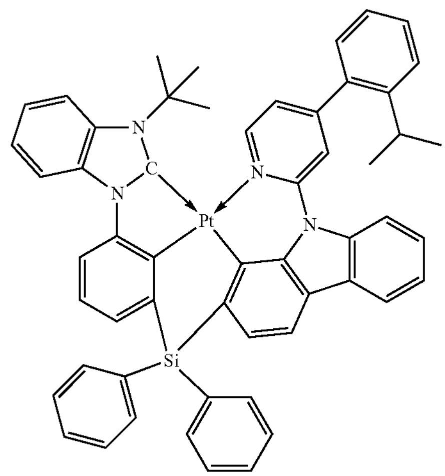

-continued
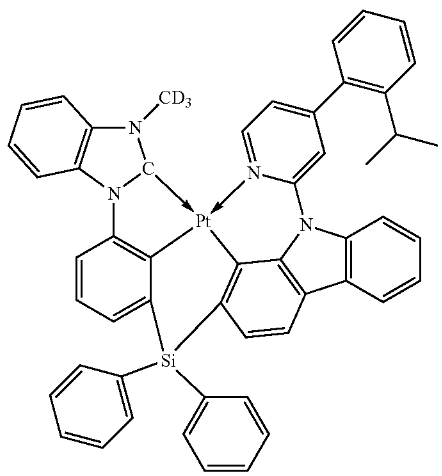
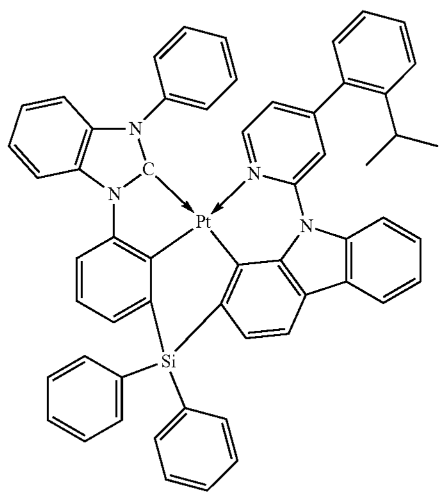
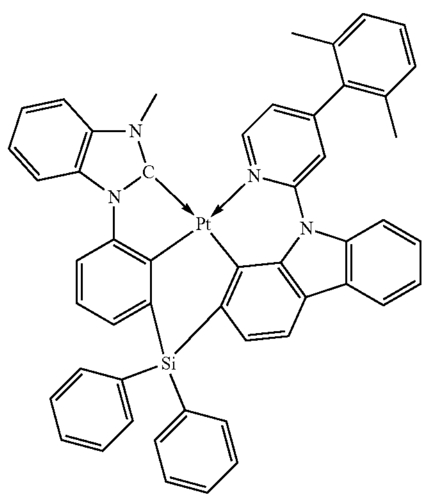
-continued
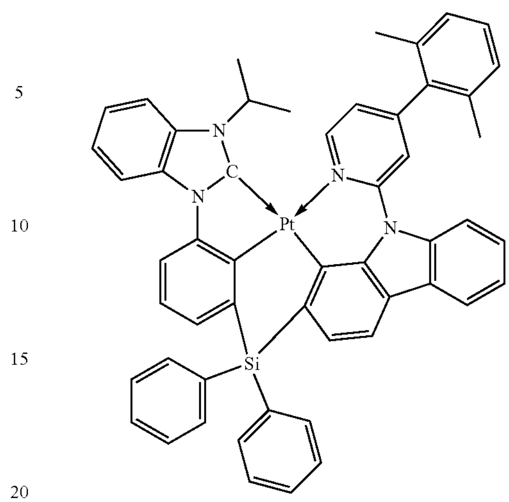
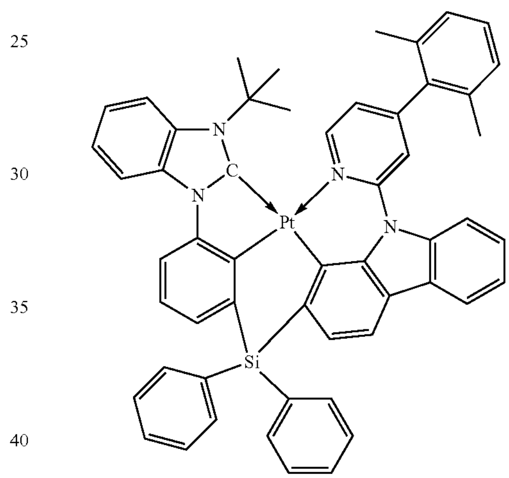
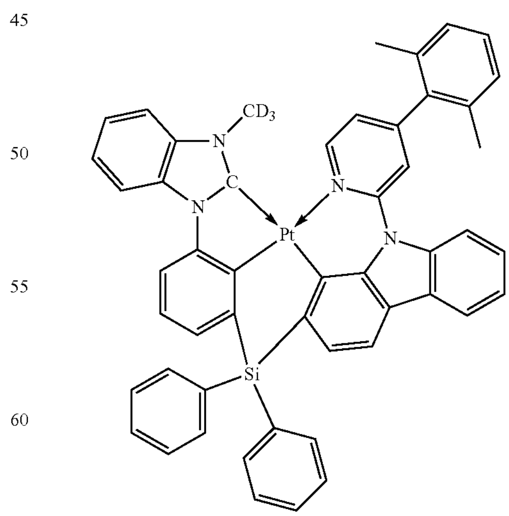

-continued
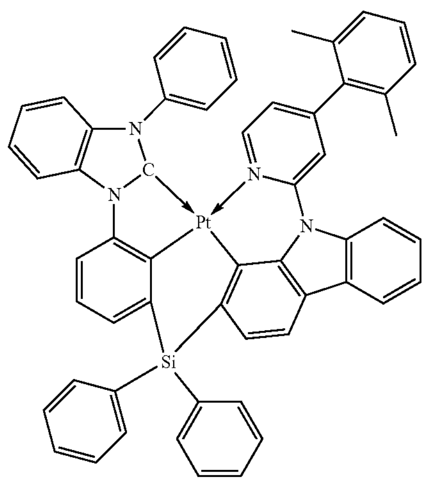
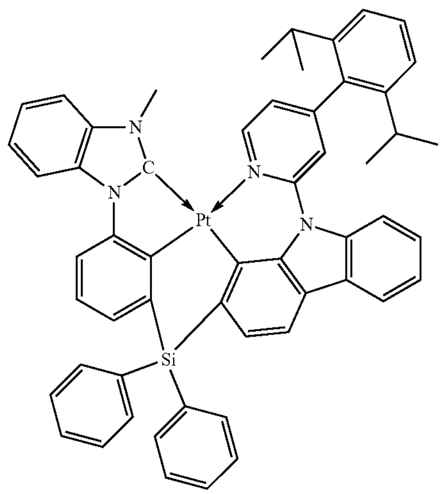
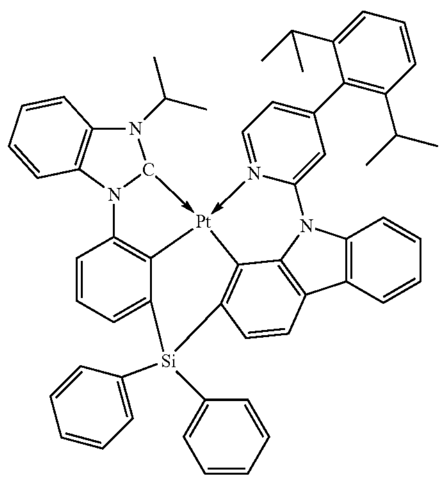
-continued
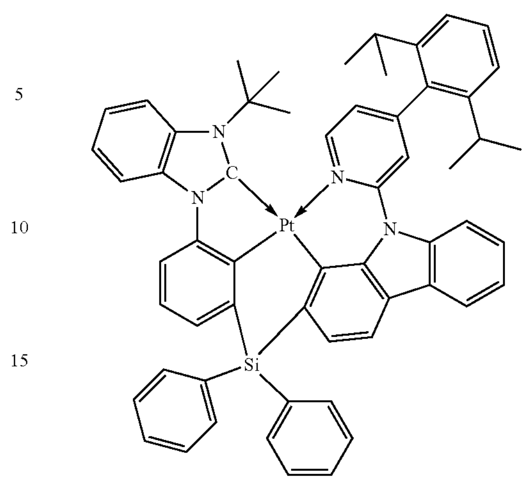
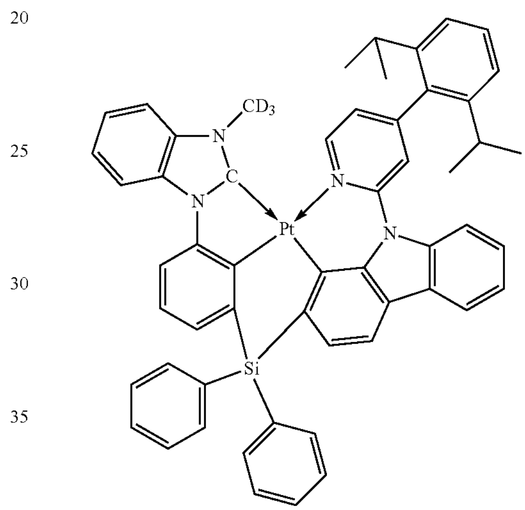
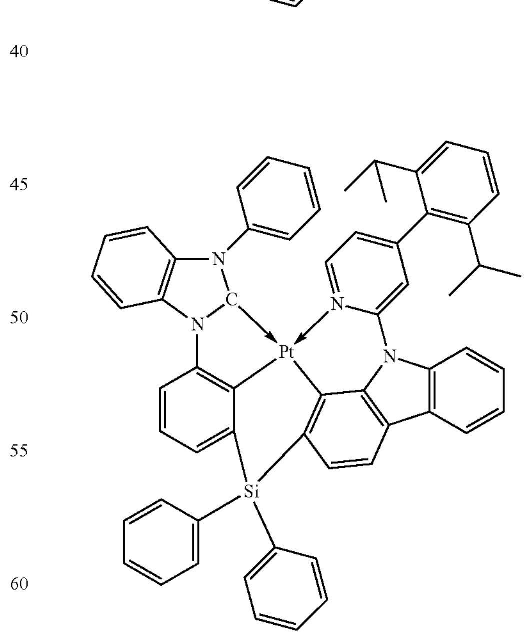

-continued
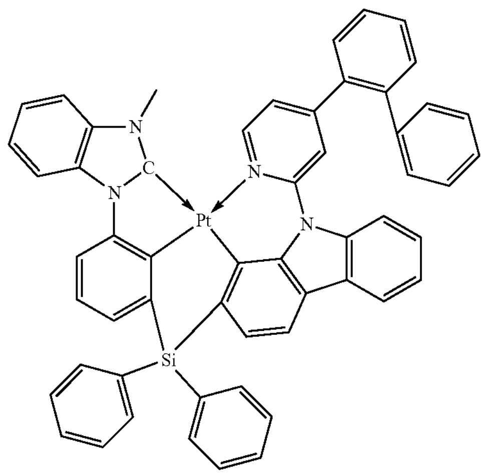
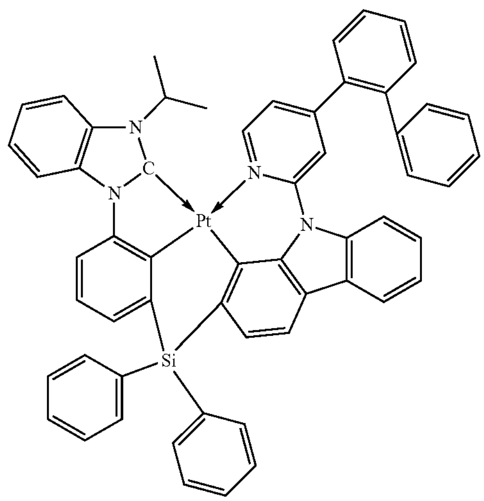
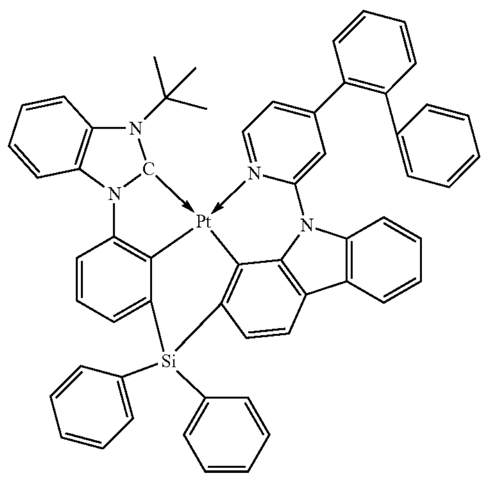
-continued
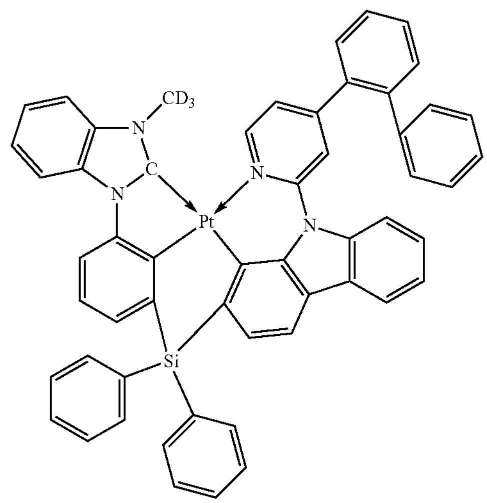
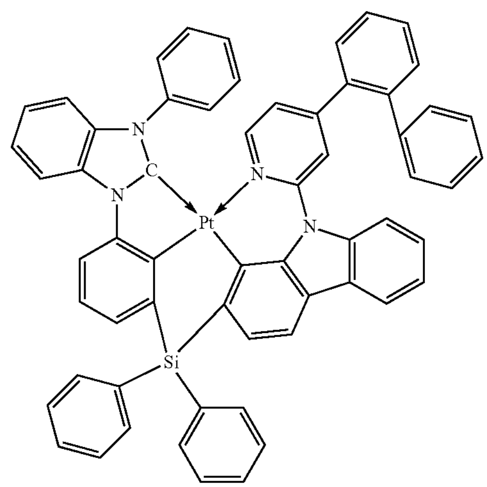
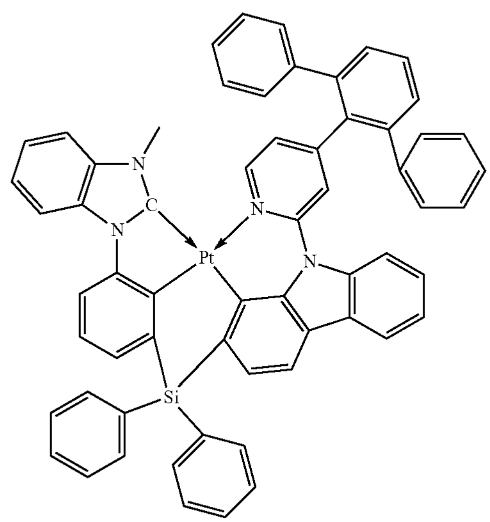

-continued
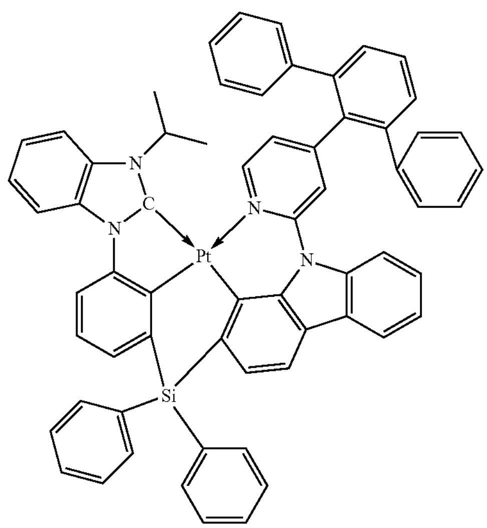
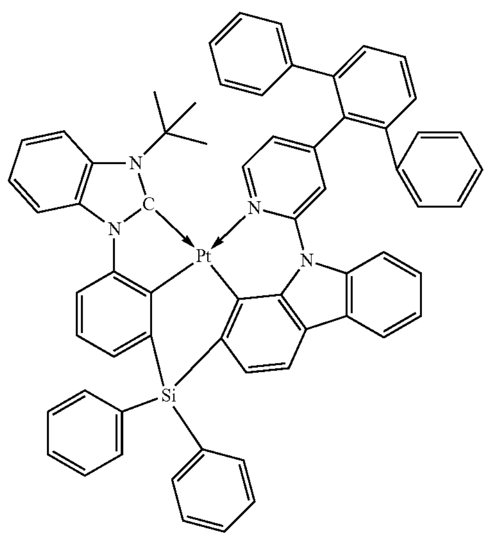
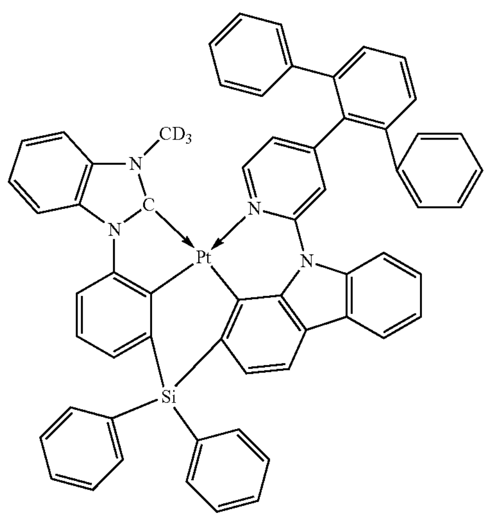
-continued
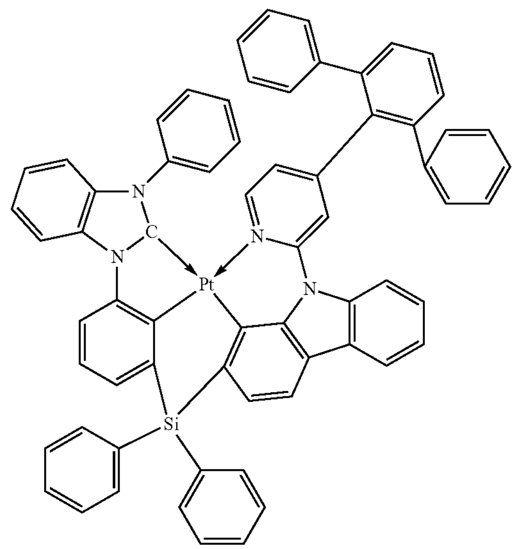
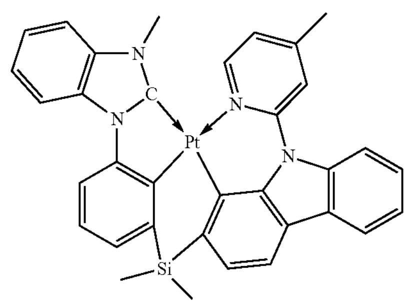
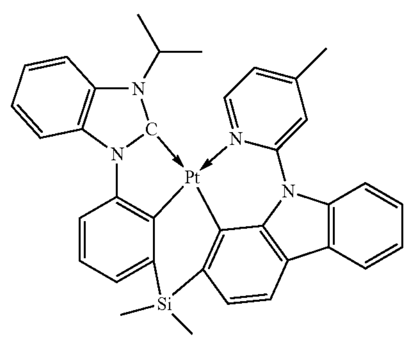
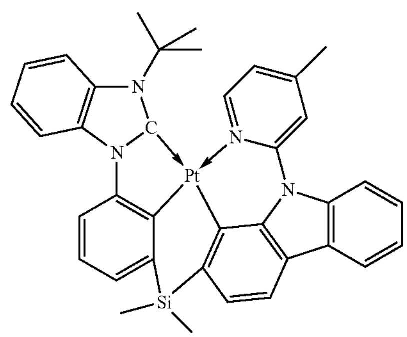

-continued
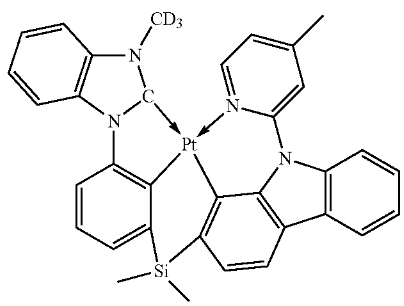
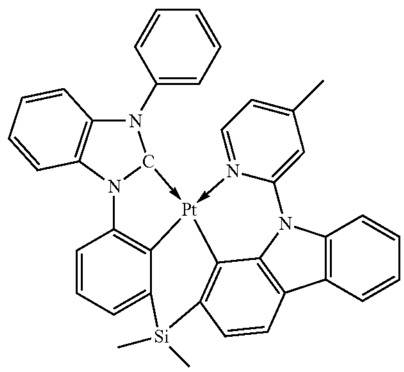
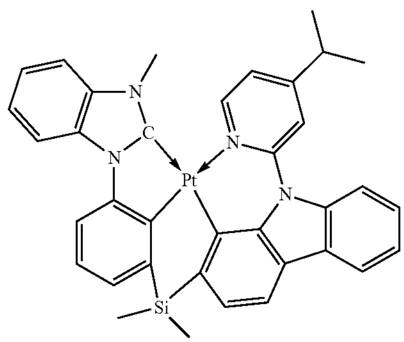
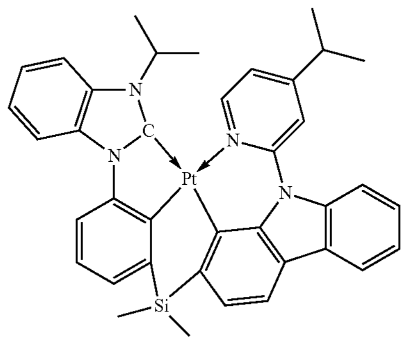
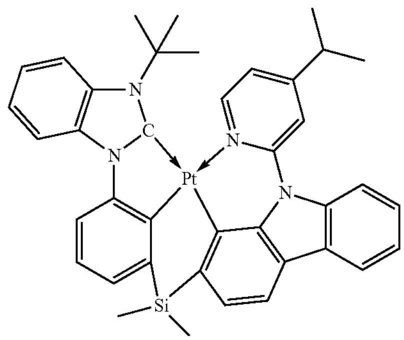
-continued
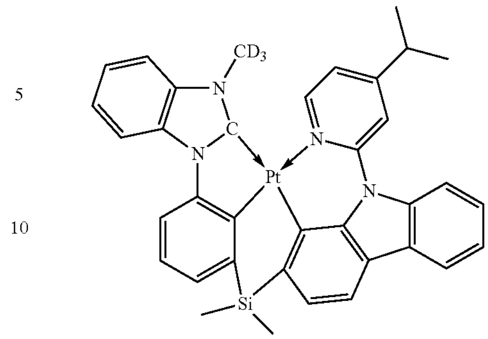
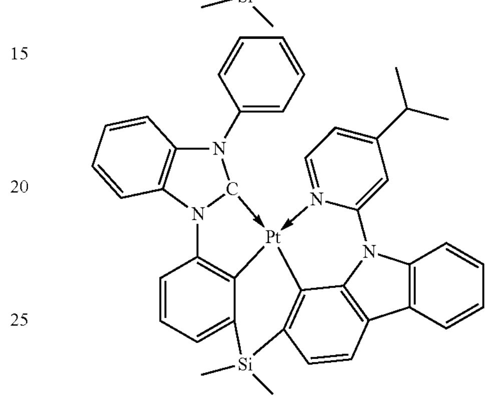
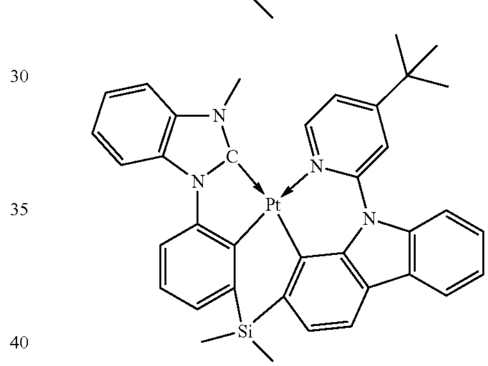
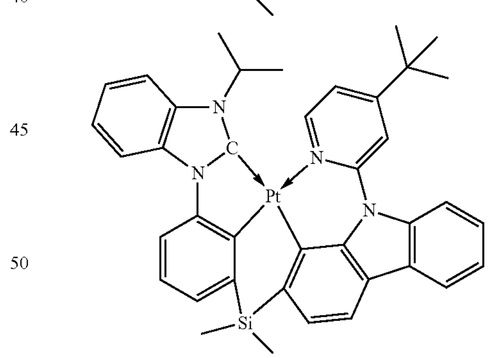
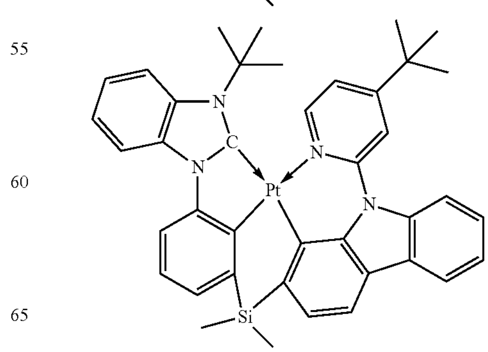

-continued
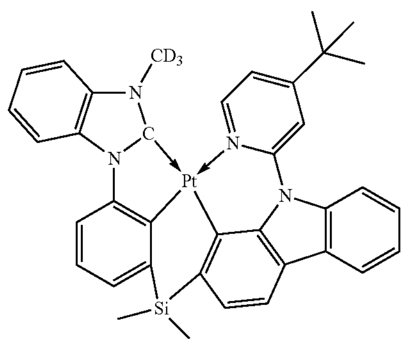
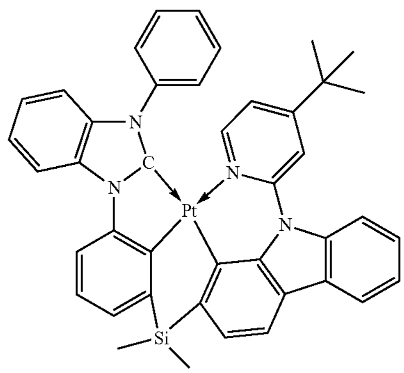
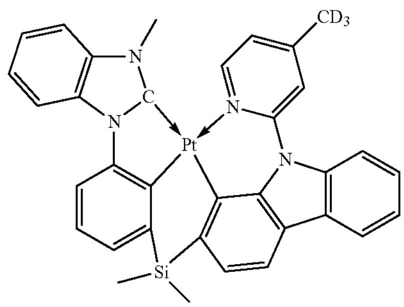
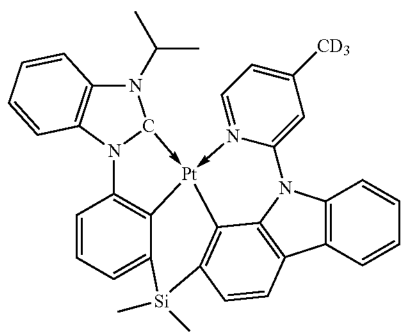
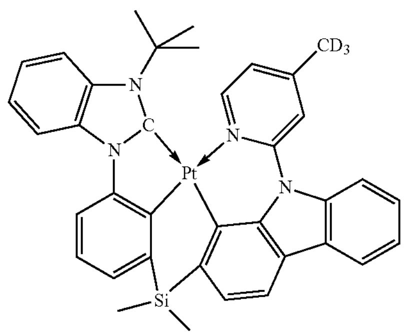
-continued
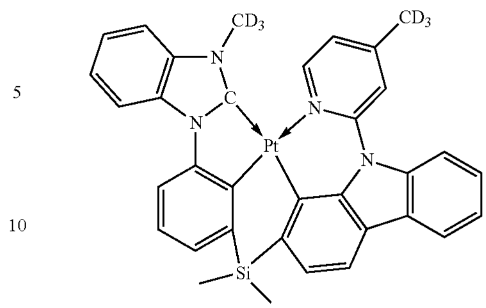
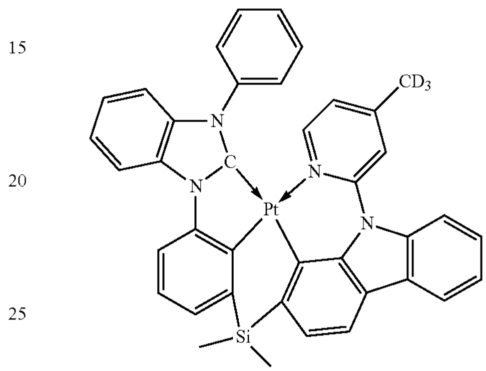
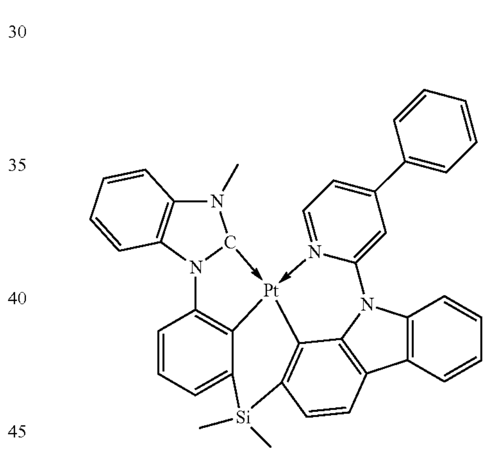
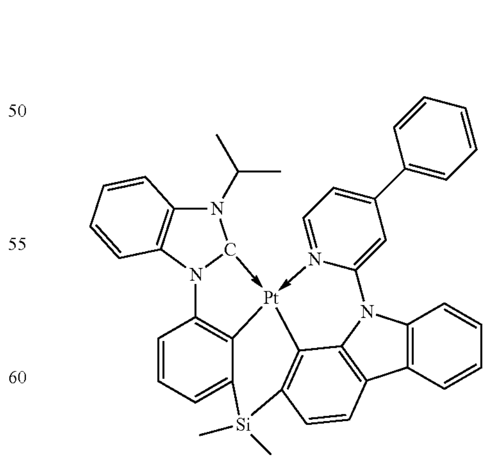
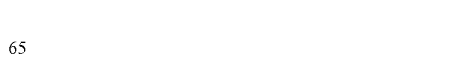

-continued
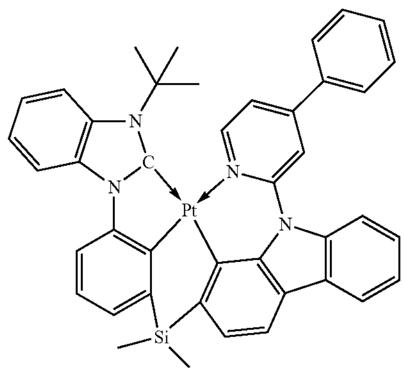
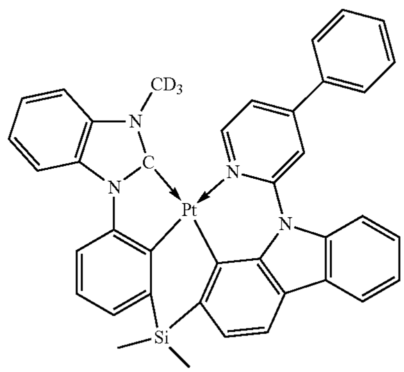
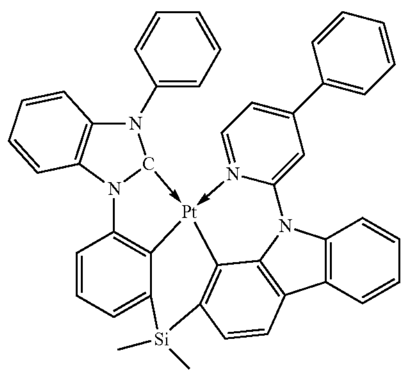
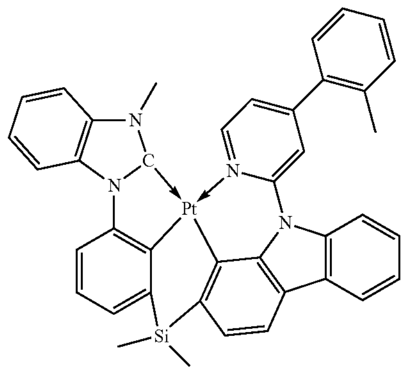
-continued
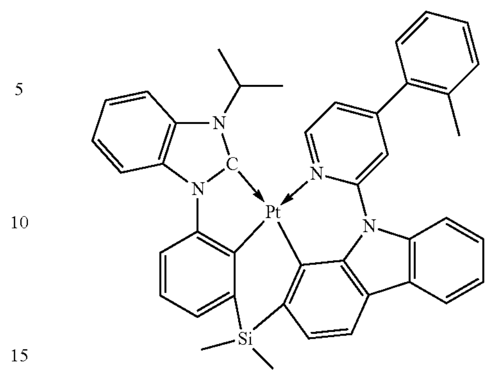
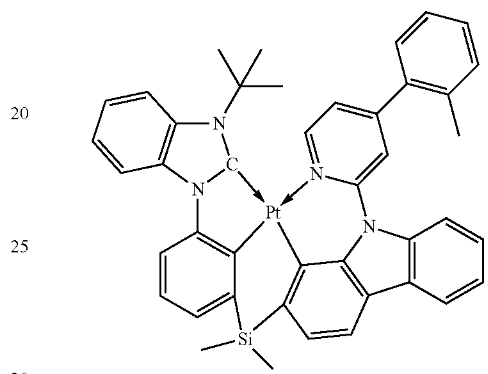
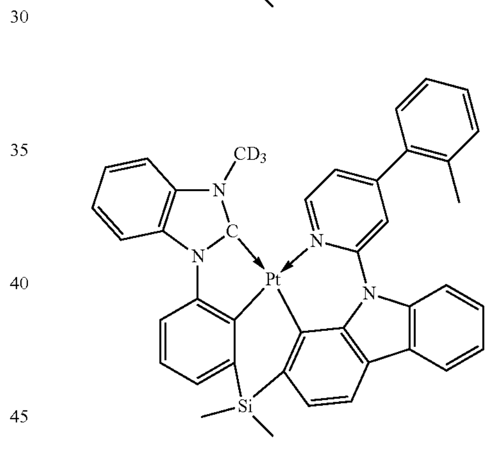
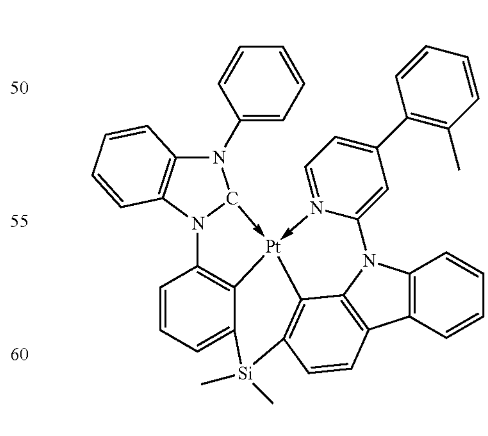
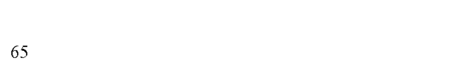

-continued
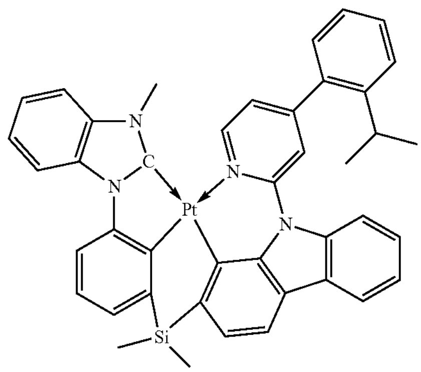
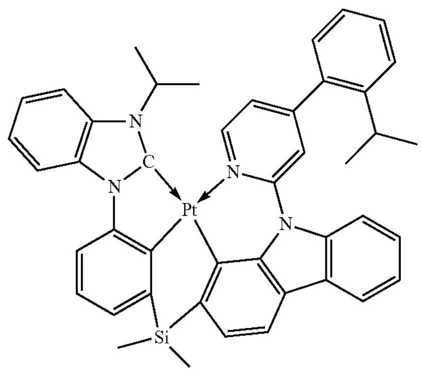
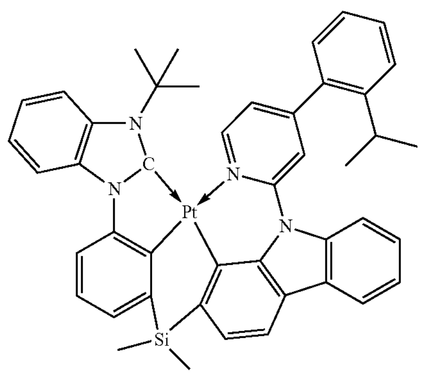
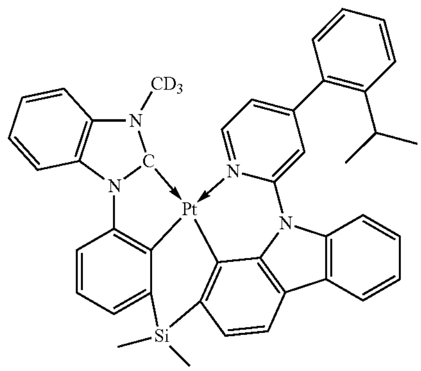
-continued
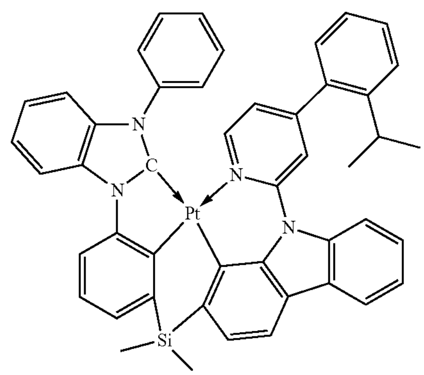
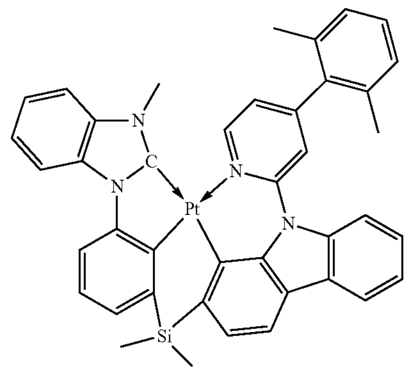
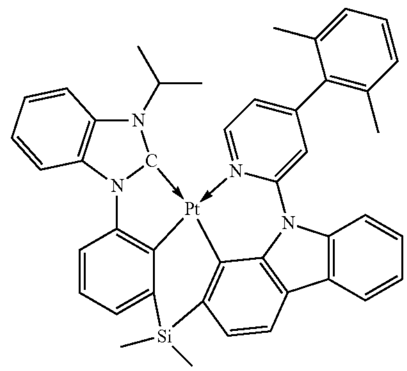
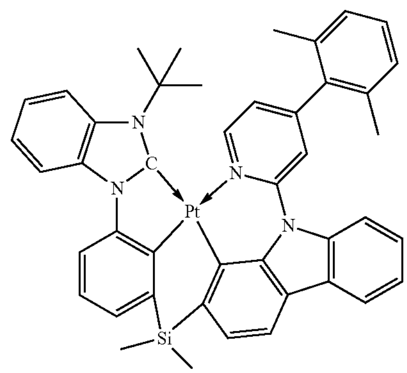

-continued
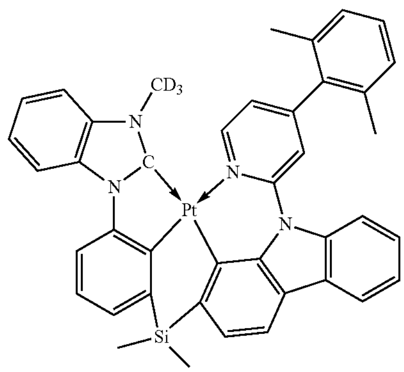
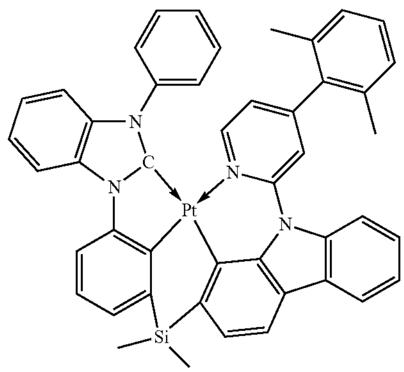
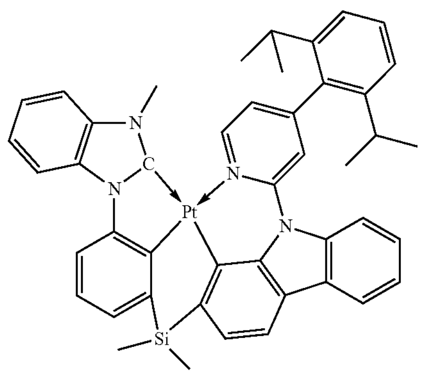
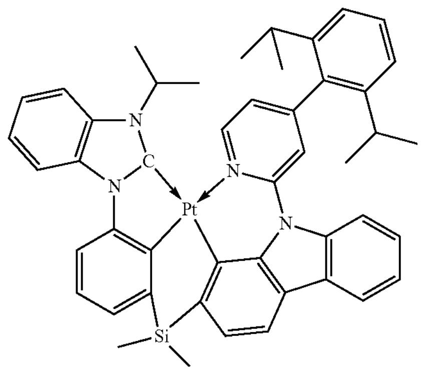
-continued
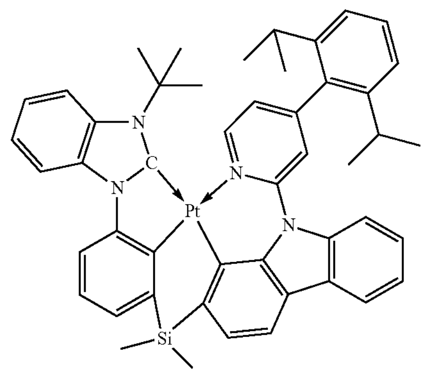
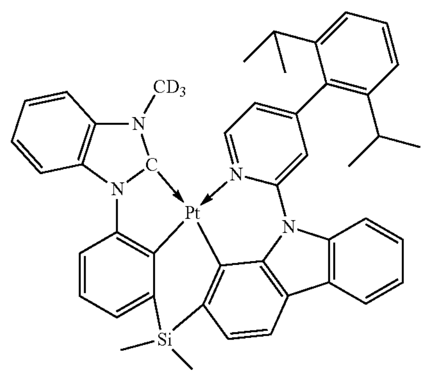
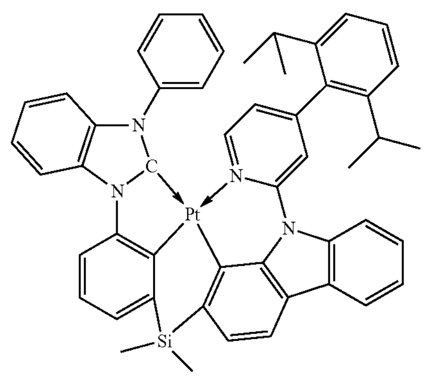
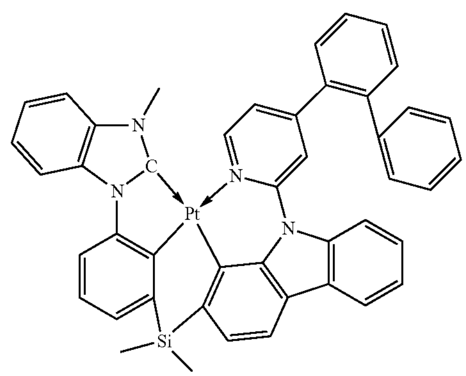

-continued
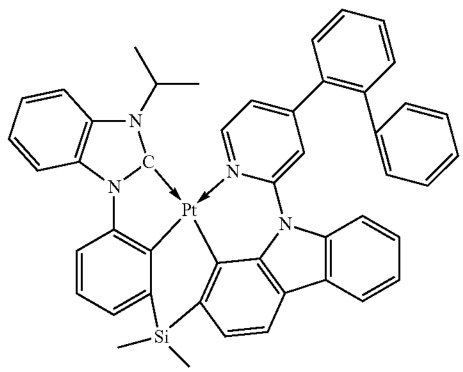
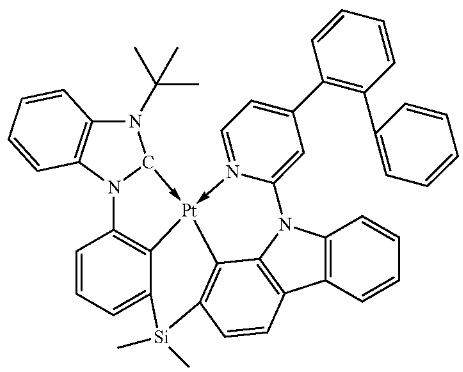
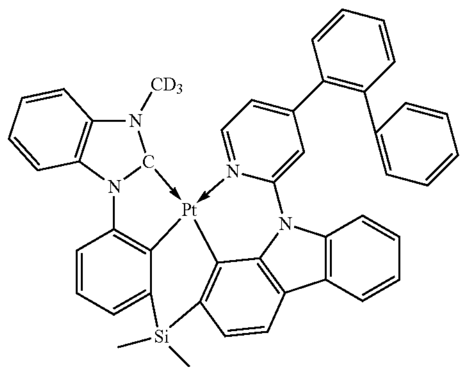
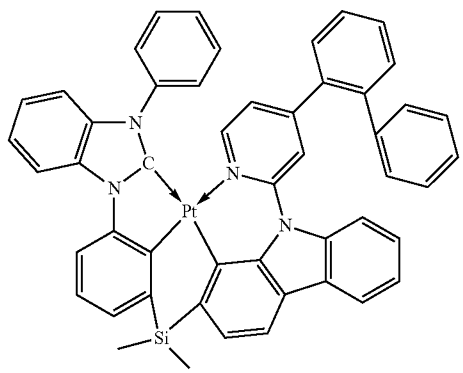
-continued
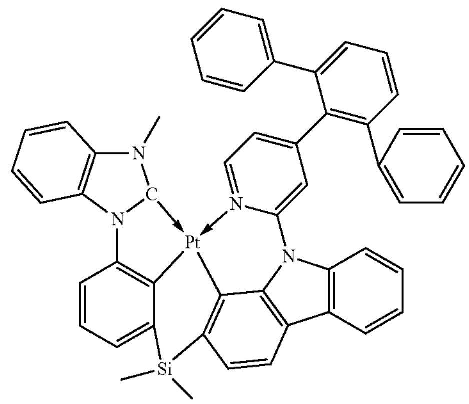
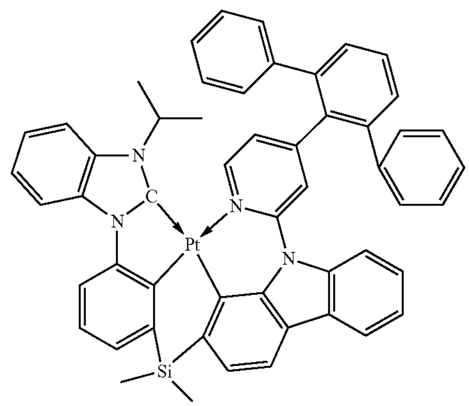
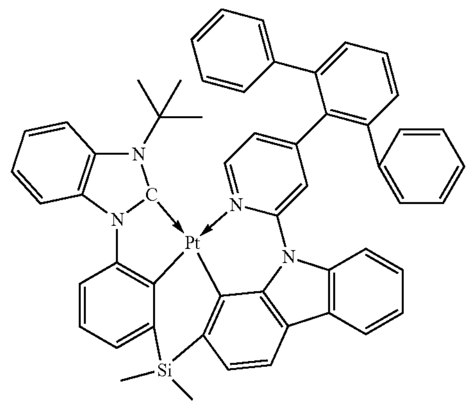
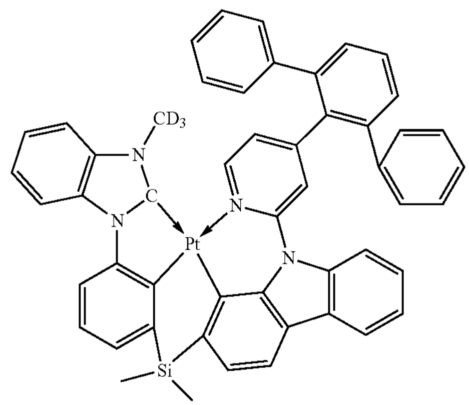

-continued
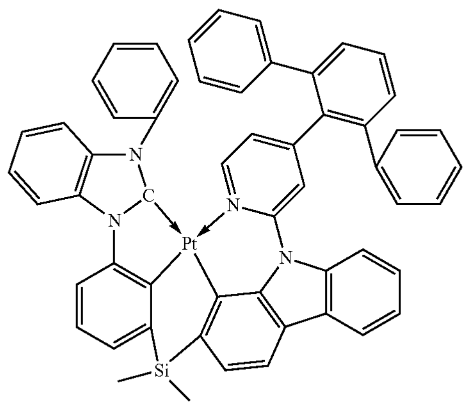
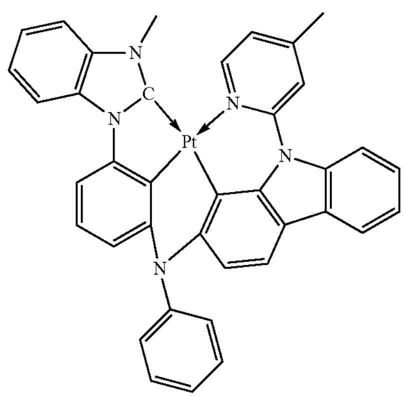
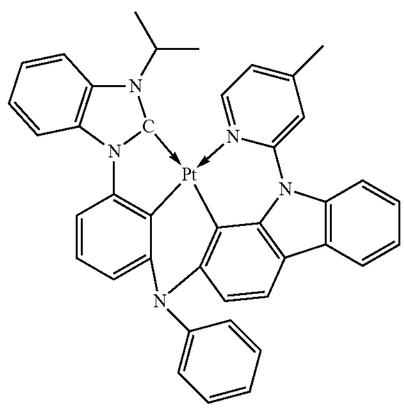
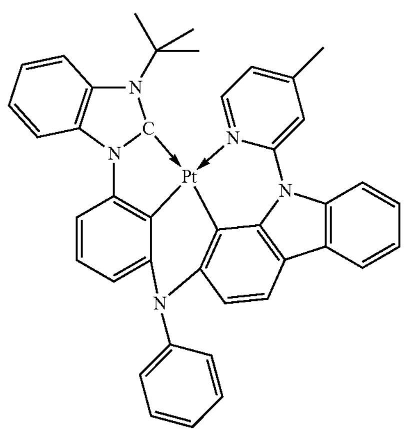
-continued
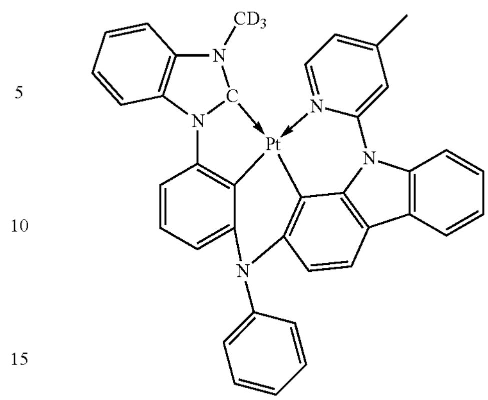
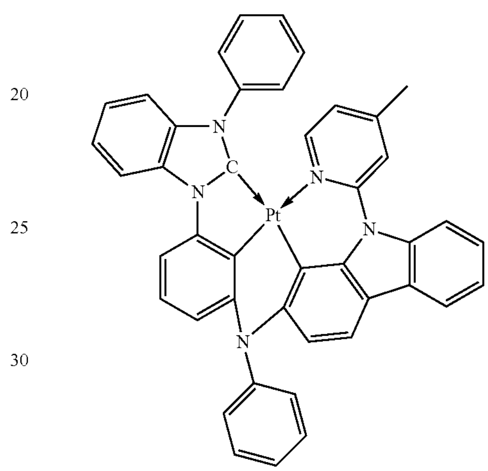
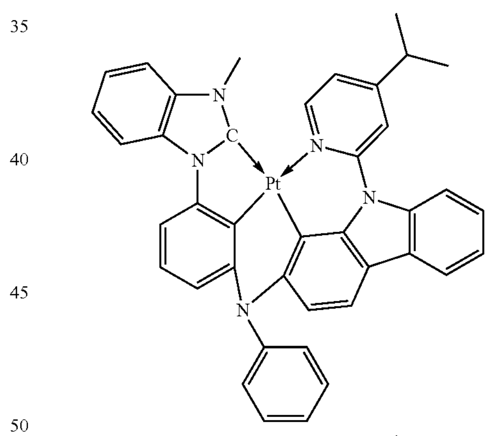
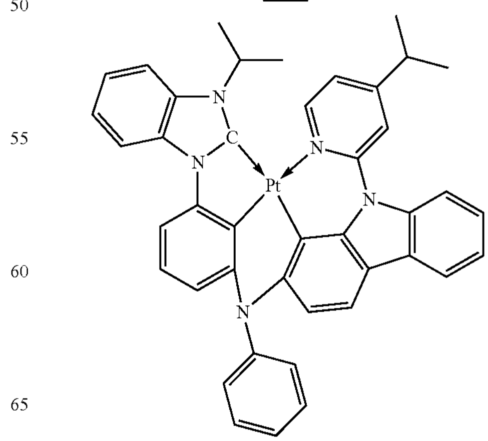

-continued
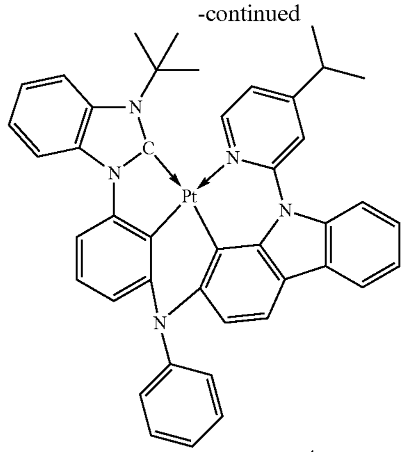
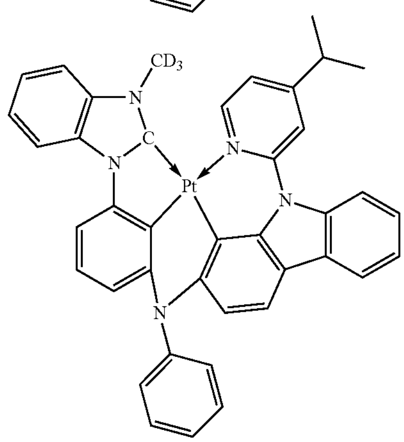
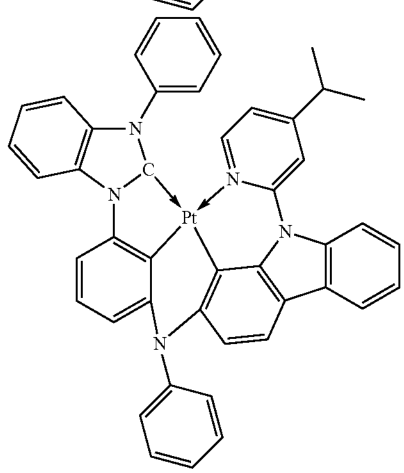
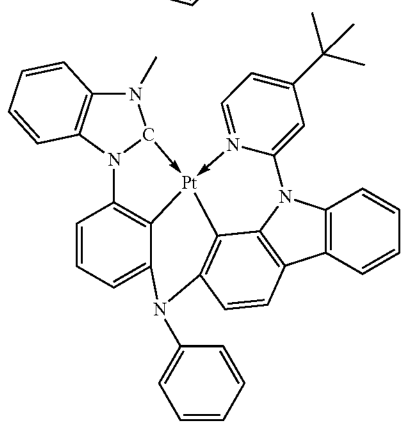
-continued
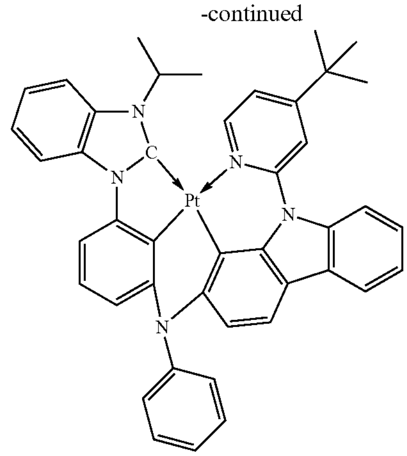
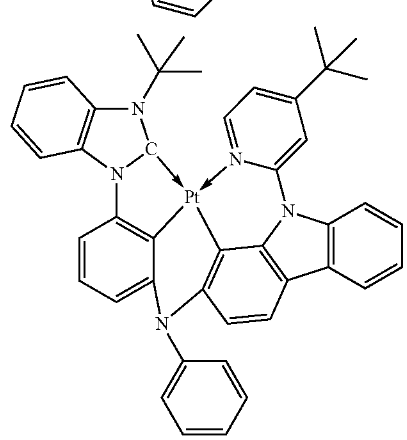
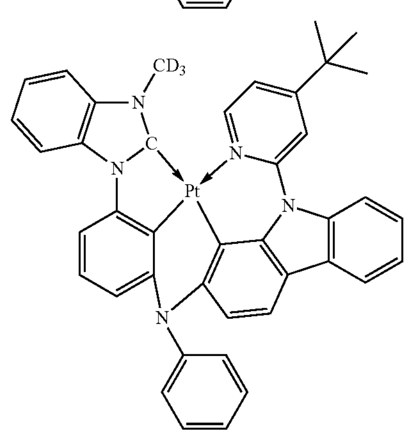
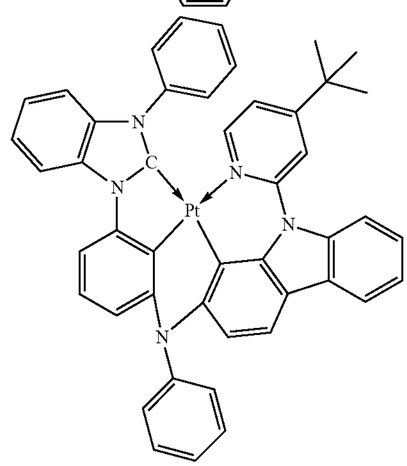

-continued
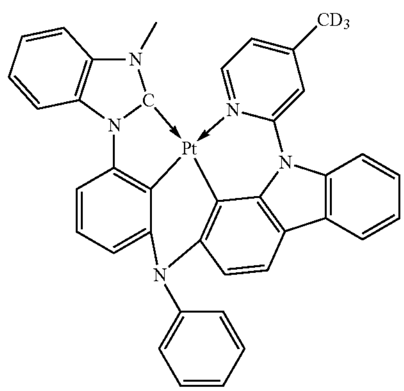
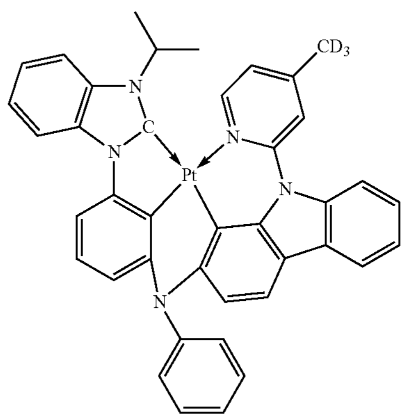
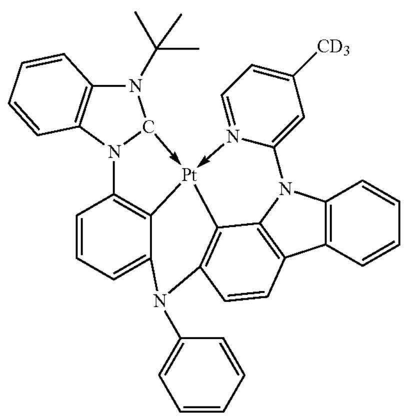
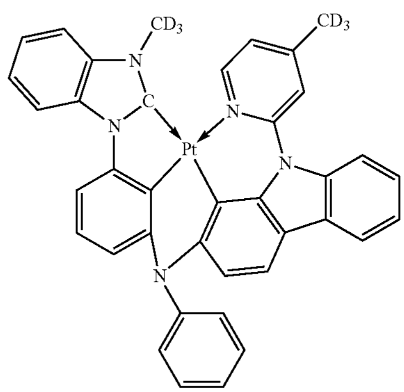
-continued
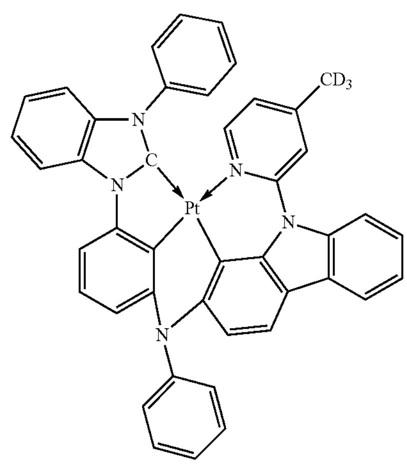
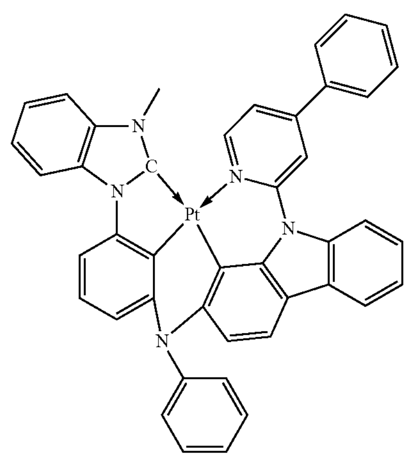
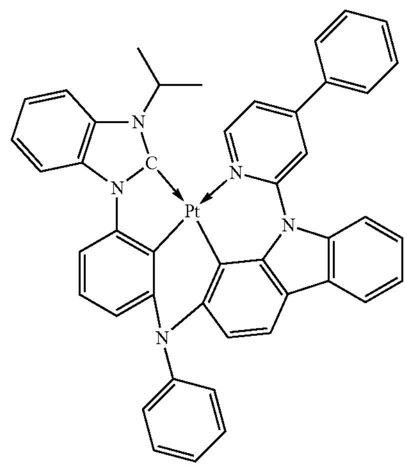

-continued
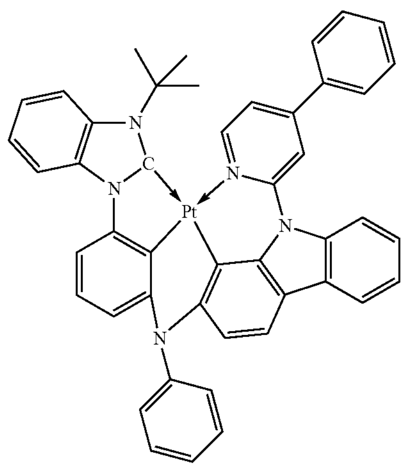
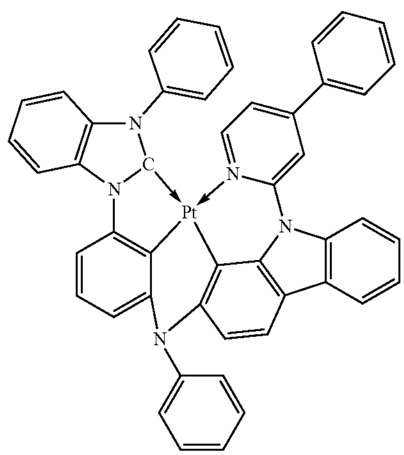
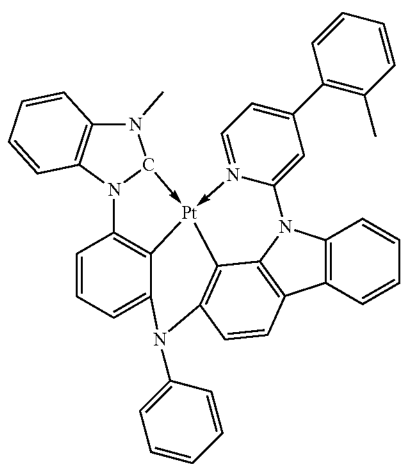
-continued
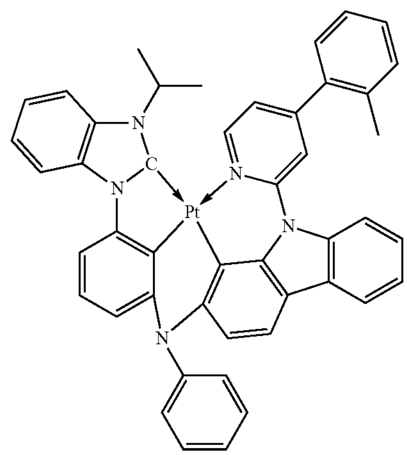
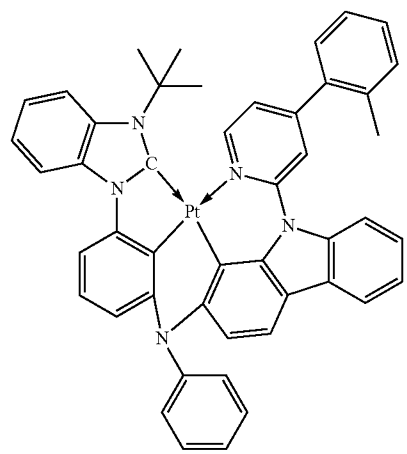
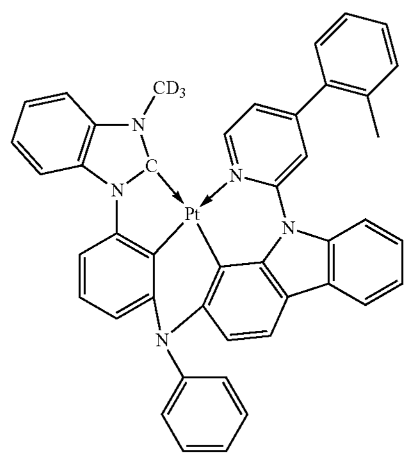

-continued
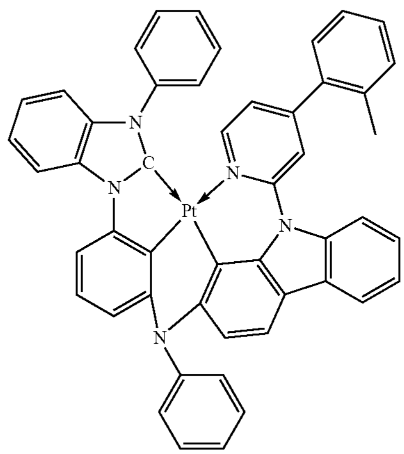
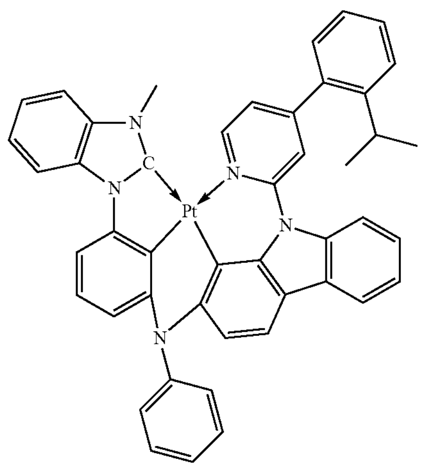
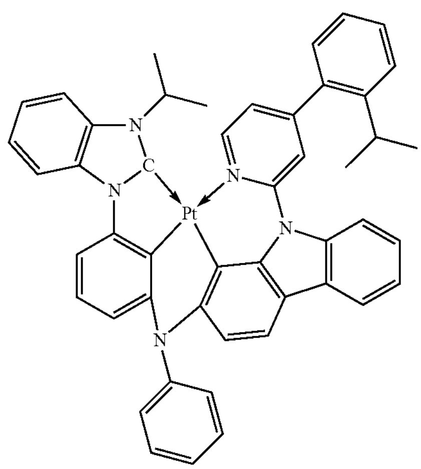
-continued
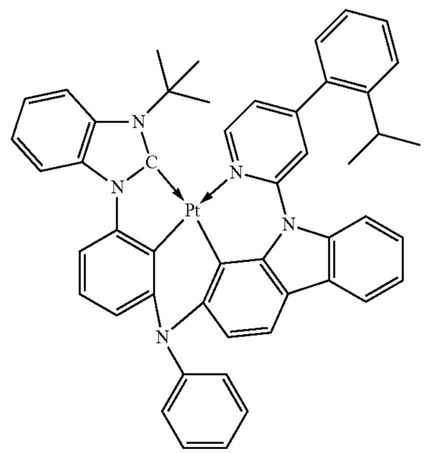
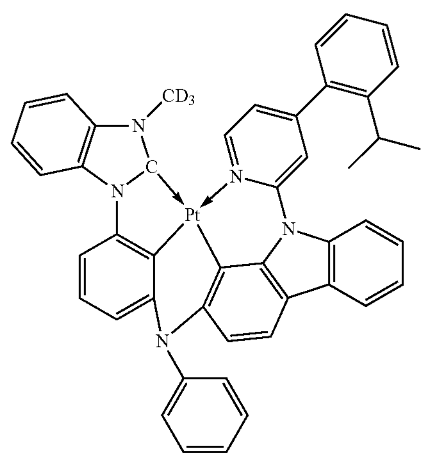
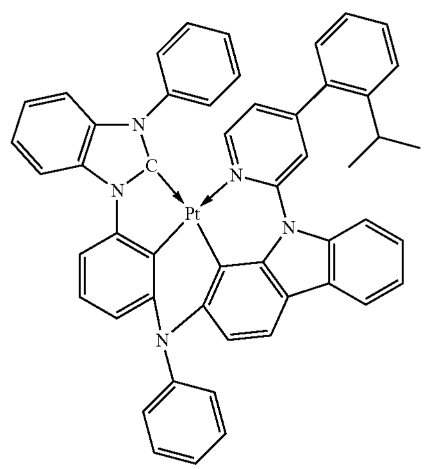

-continued
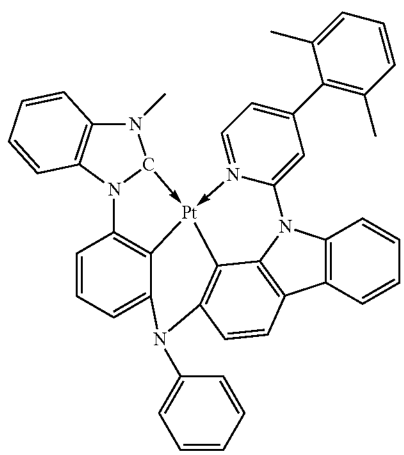
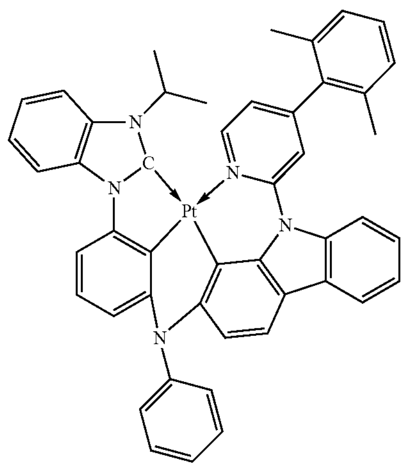
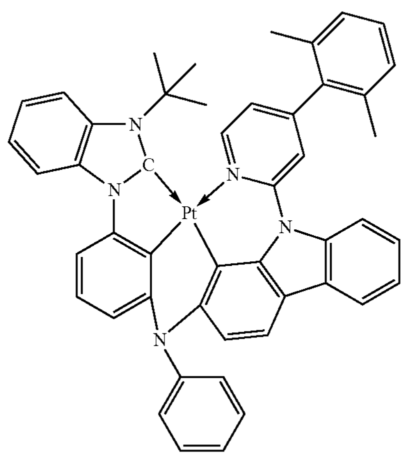
-continued
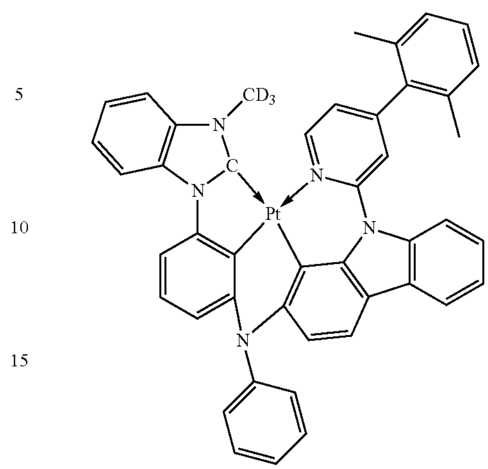
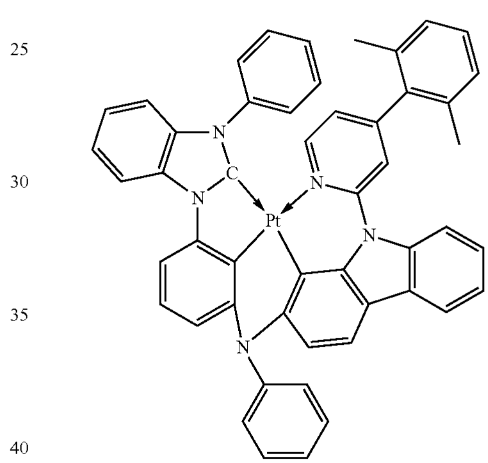
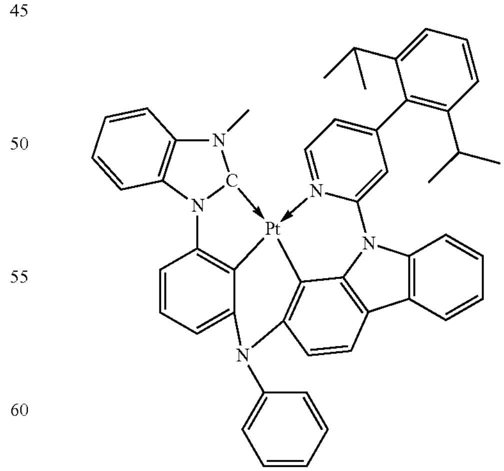

-continued
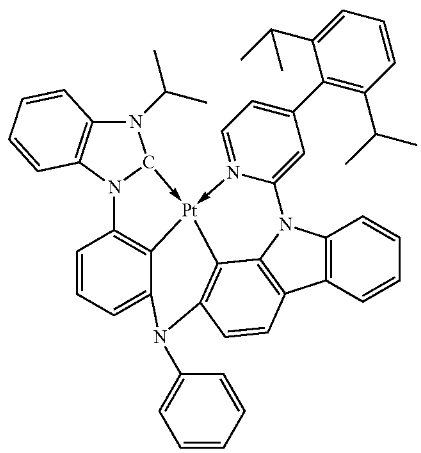
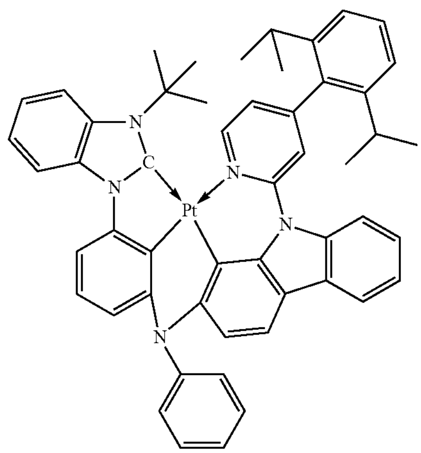
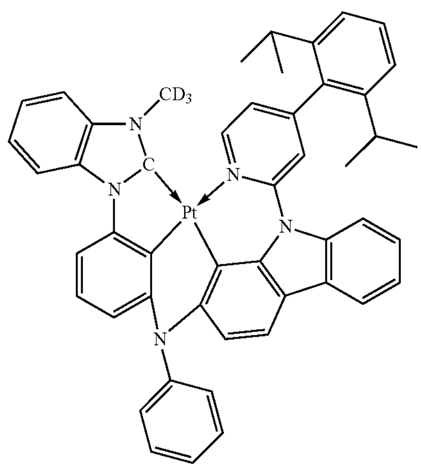
-continued
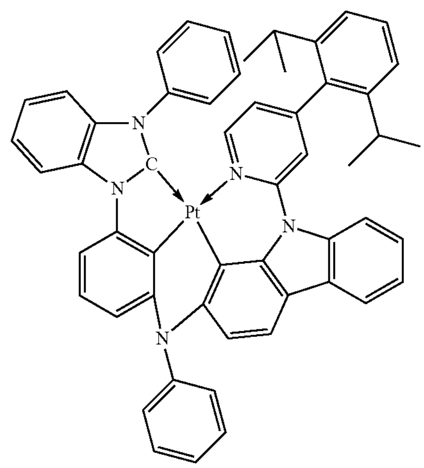
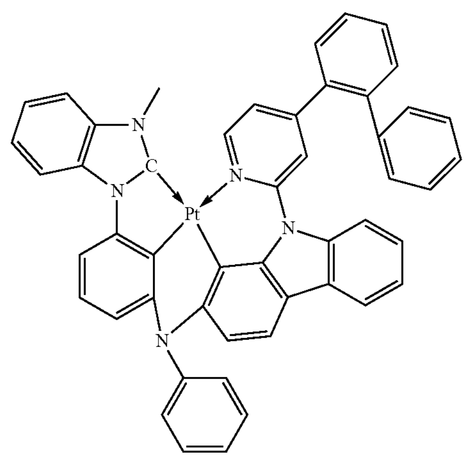
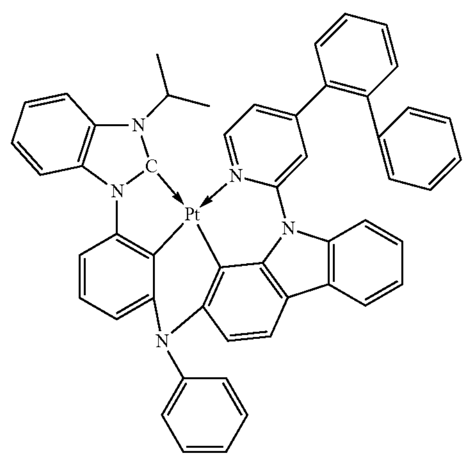

-continued
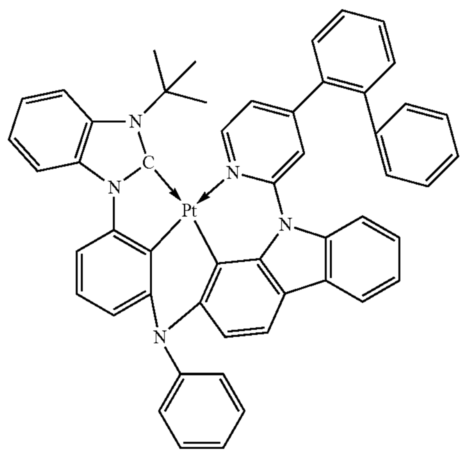
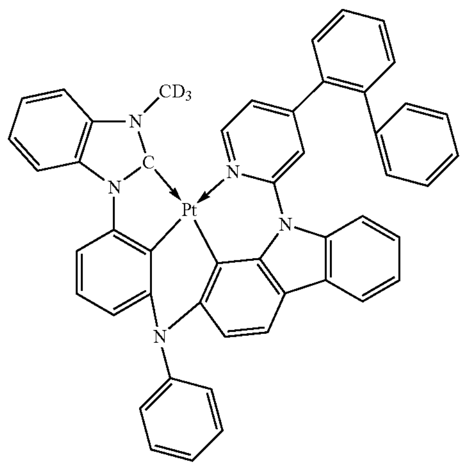
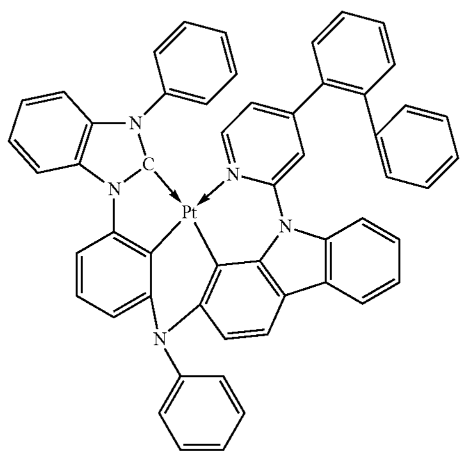
-continued
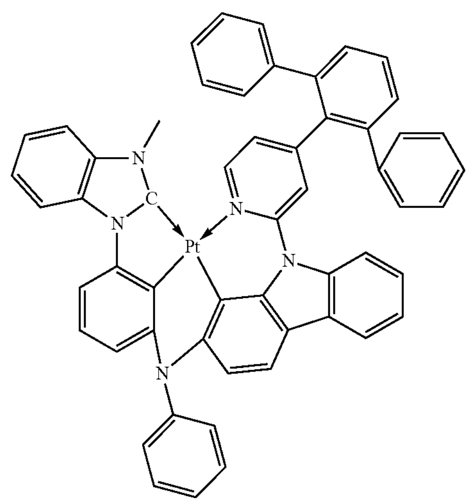
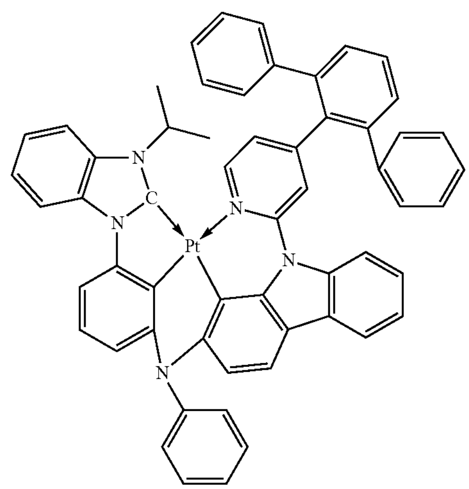
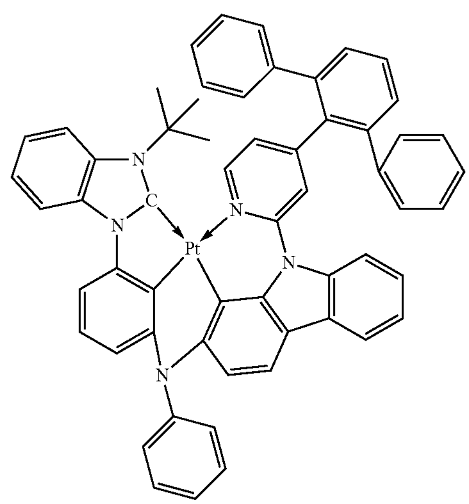

-continued
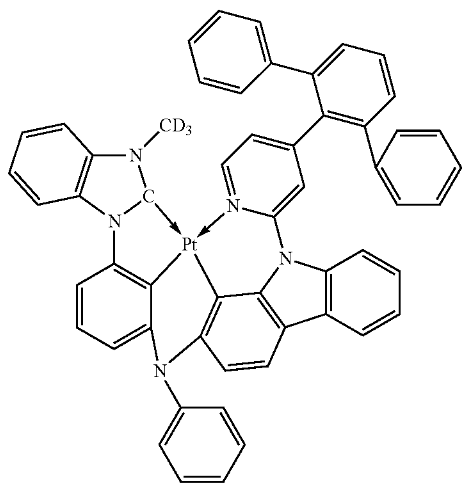
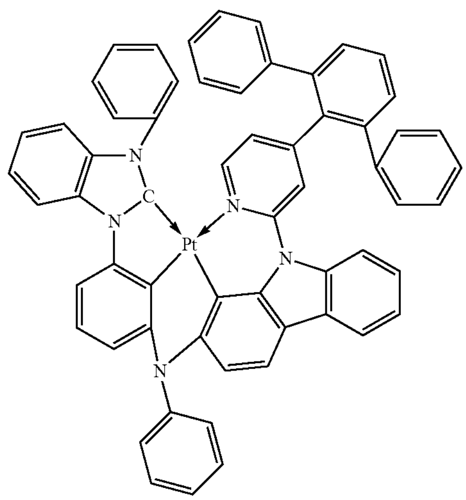
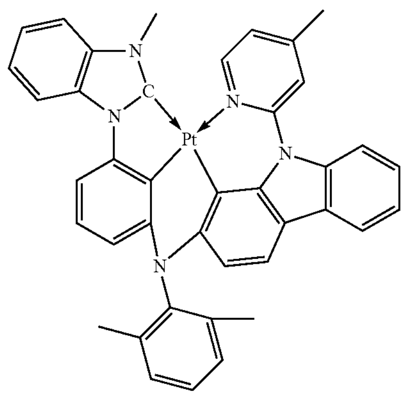
-continued
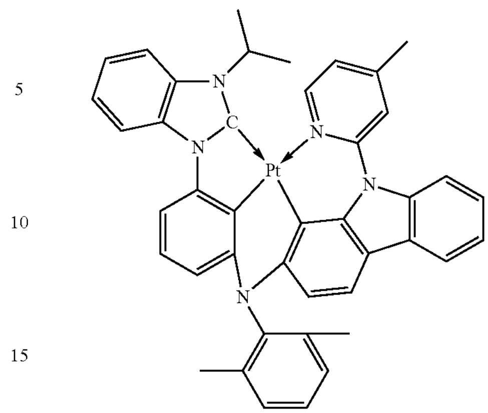
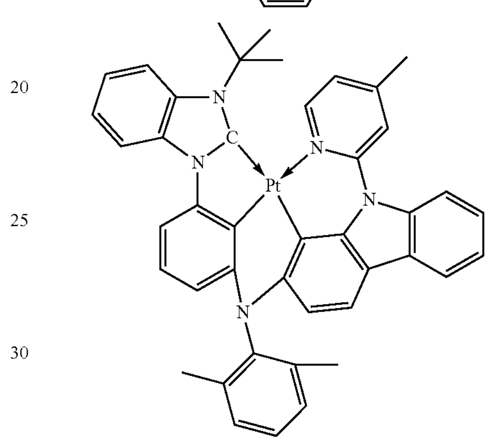
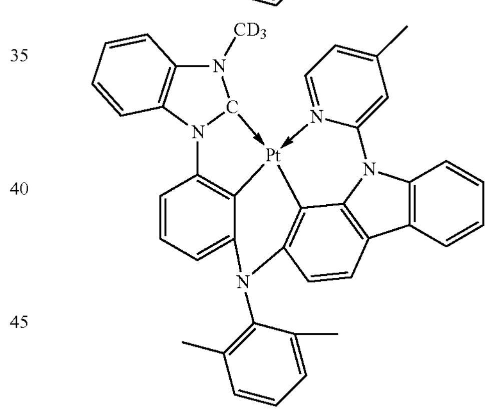
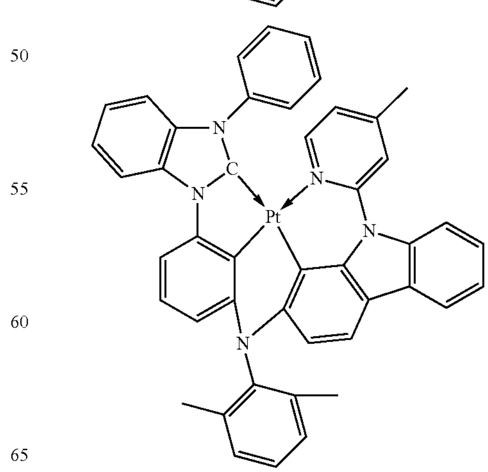

-continued
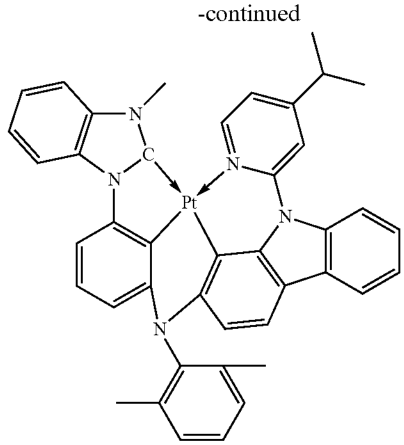
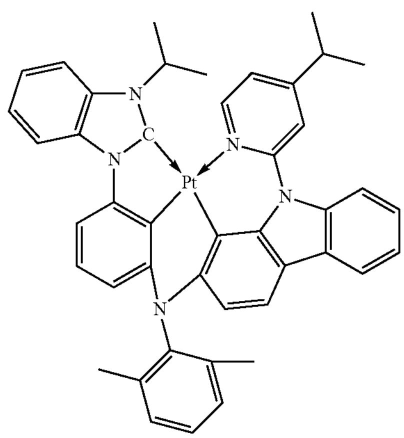
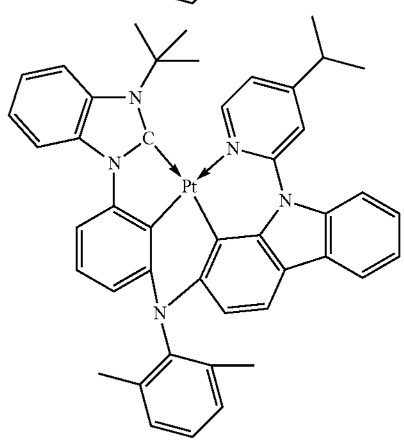
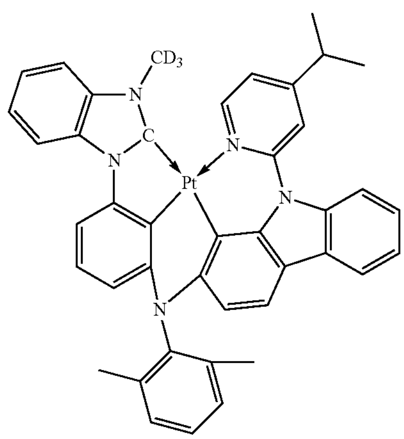
-continued
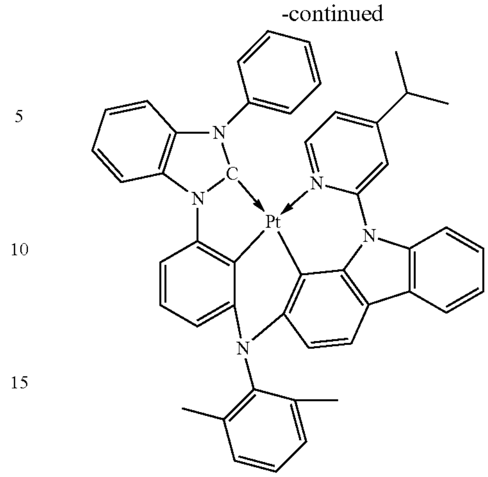
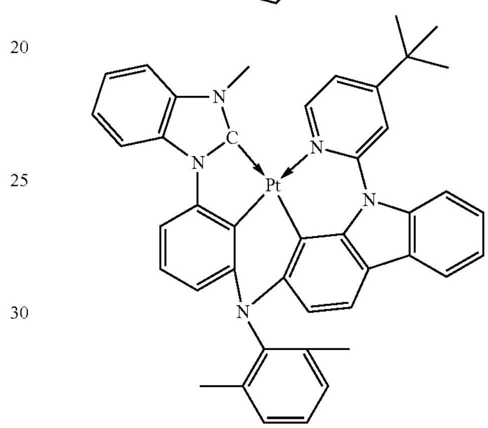
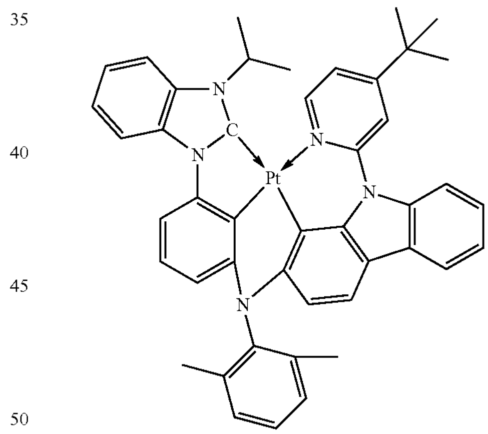
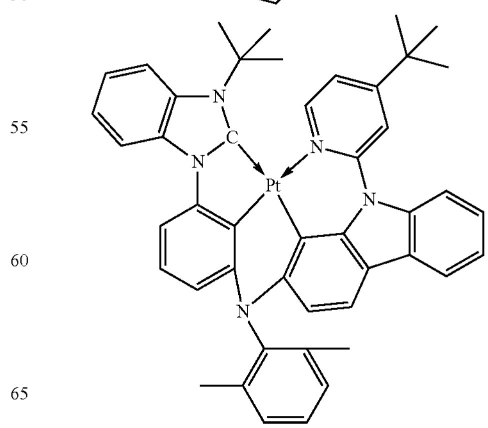

-continued
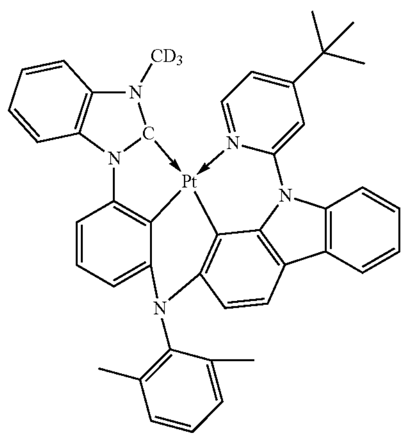
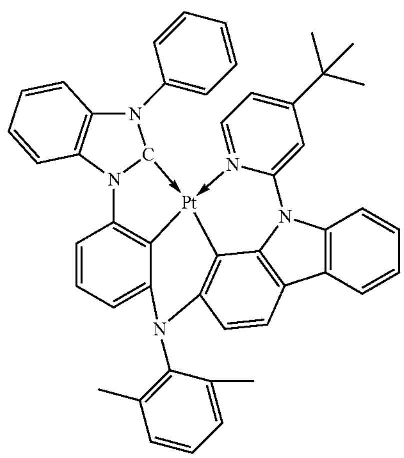
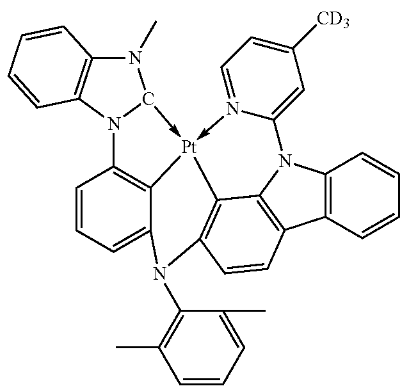
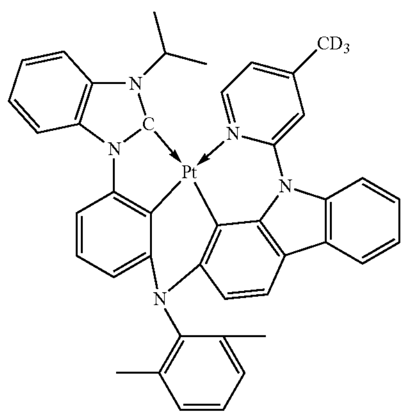
-continued
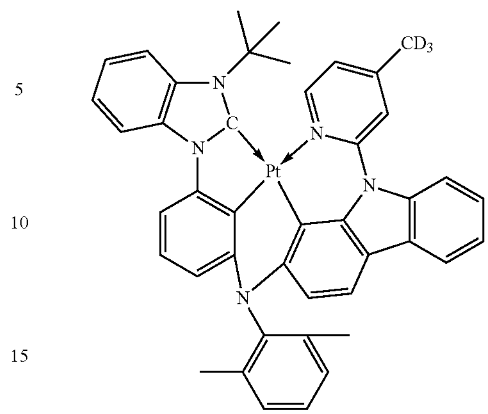
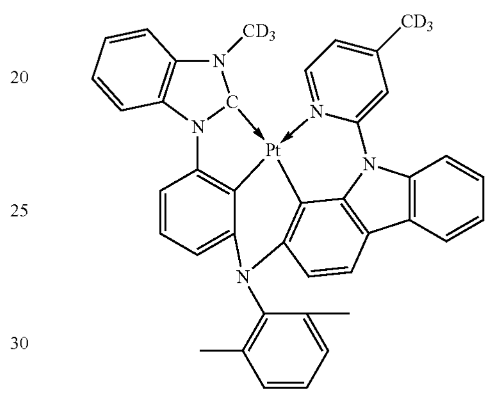
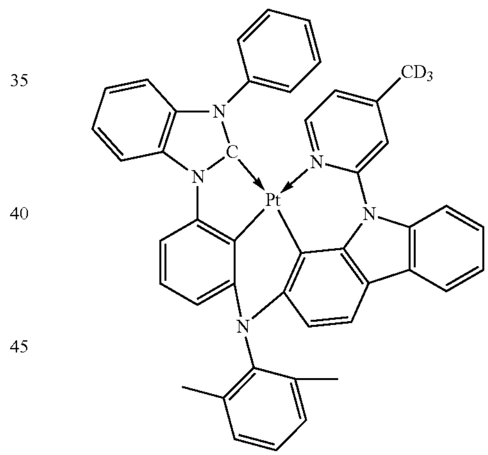
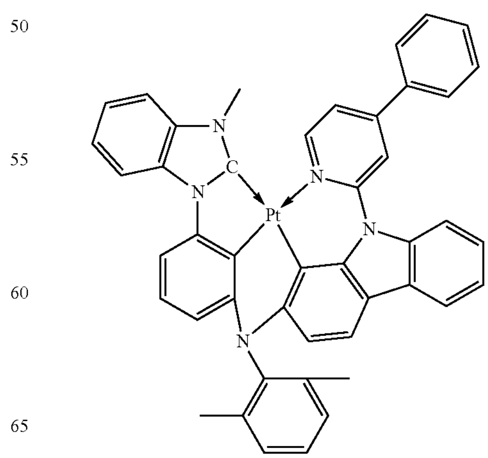

-continued
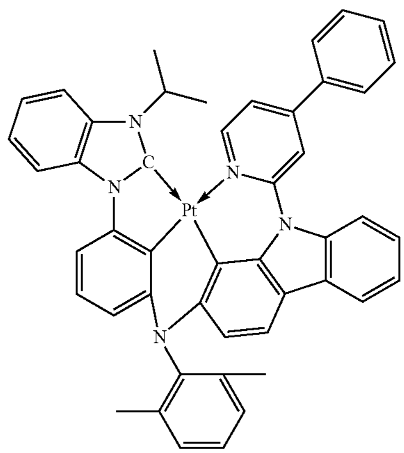
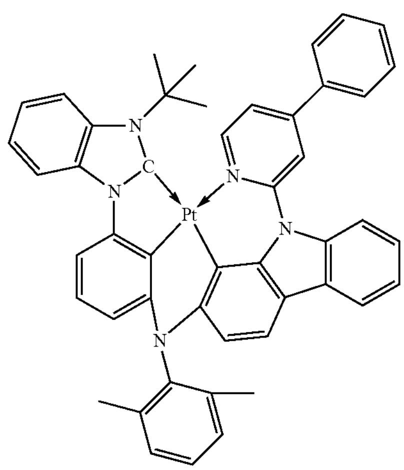
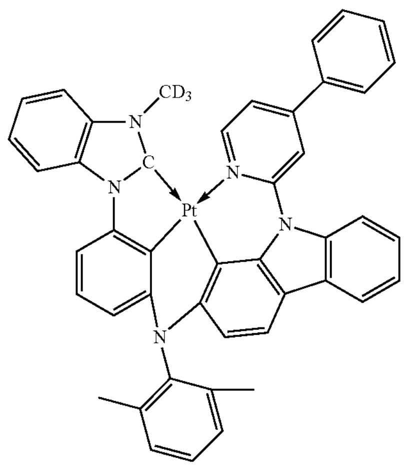
-continued
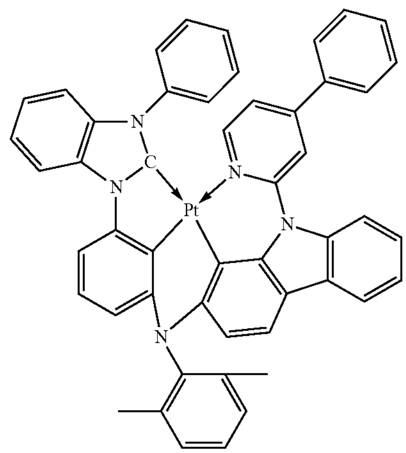
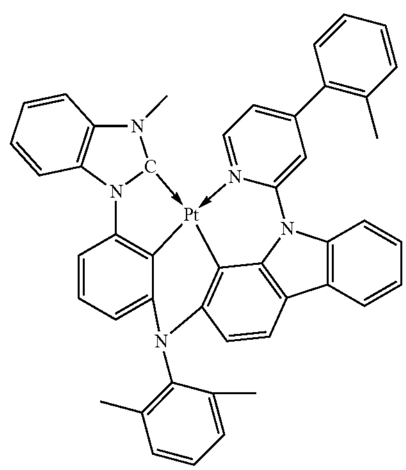
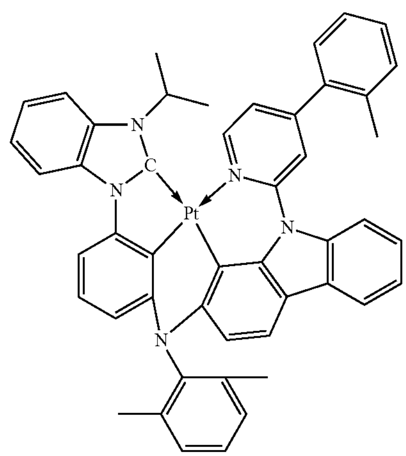

-continued
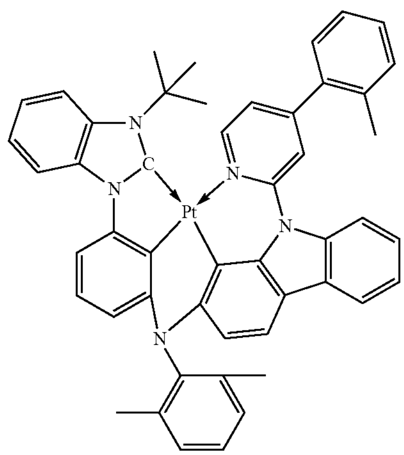
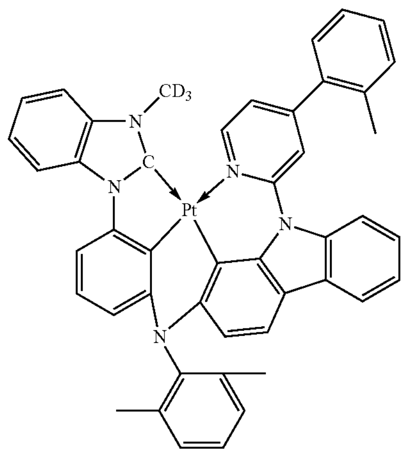
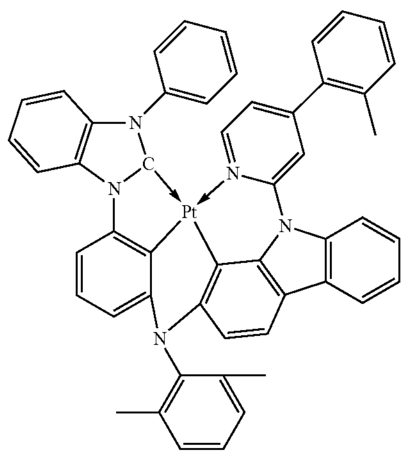
-continued
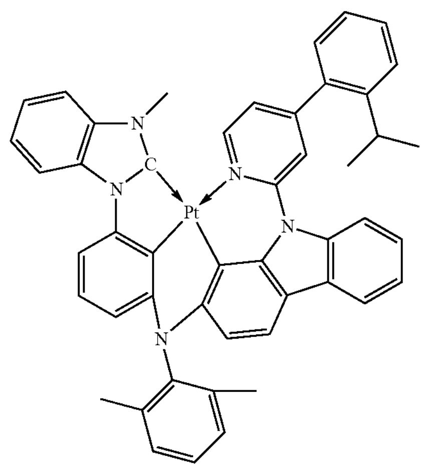
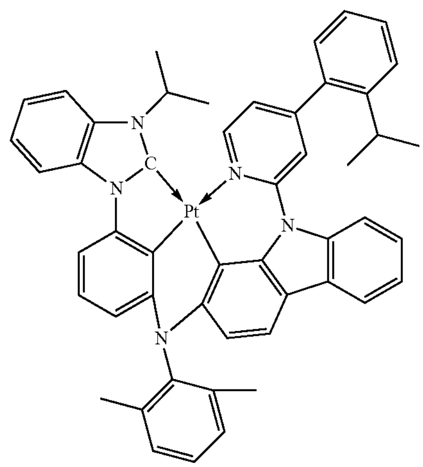
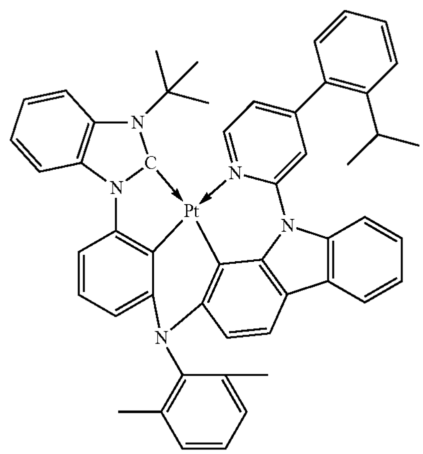

-continued
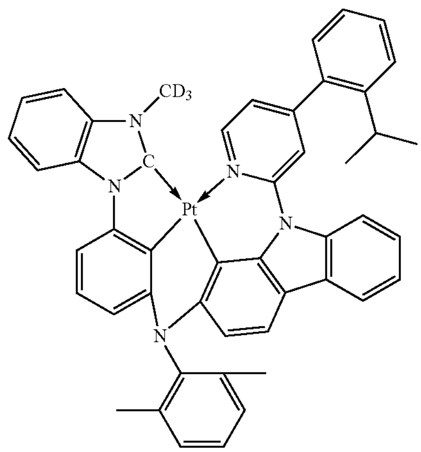
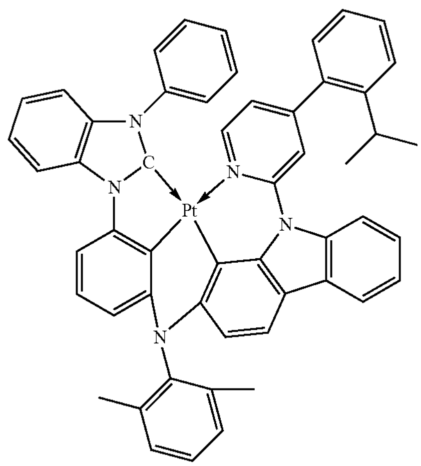
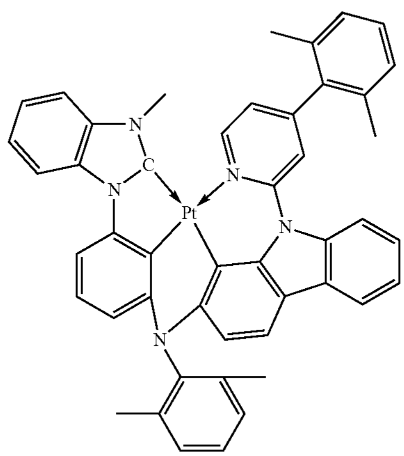
-continued
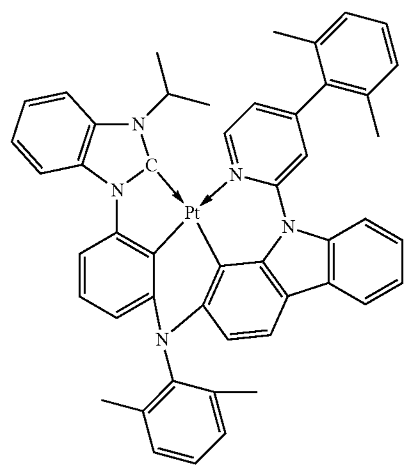
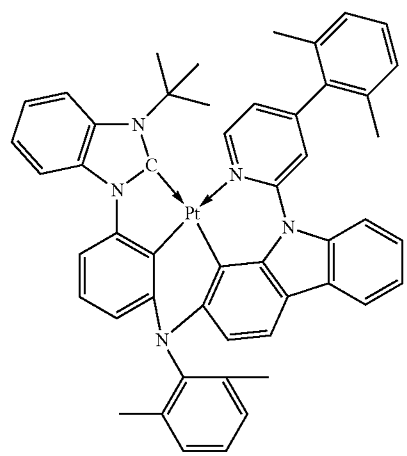
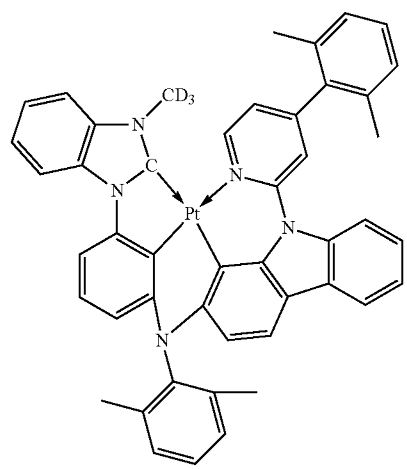

-continued
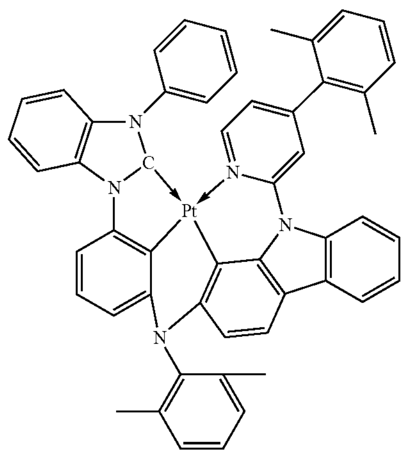
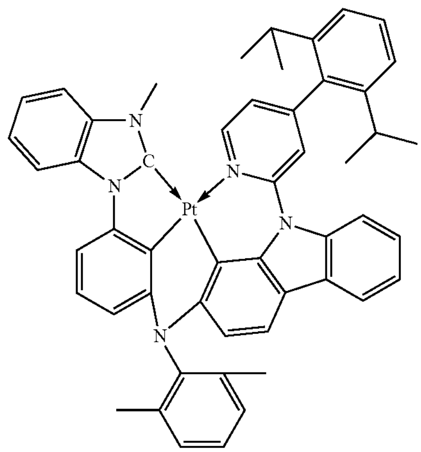
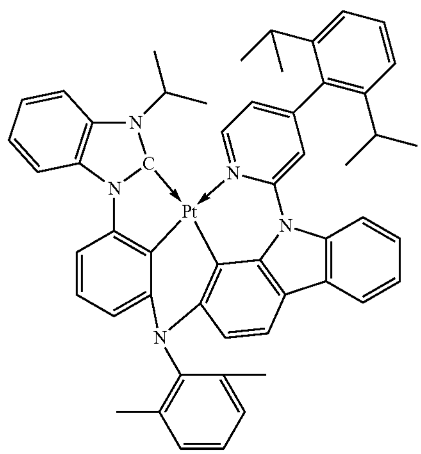
-continued
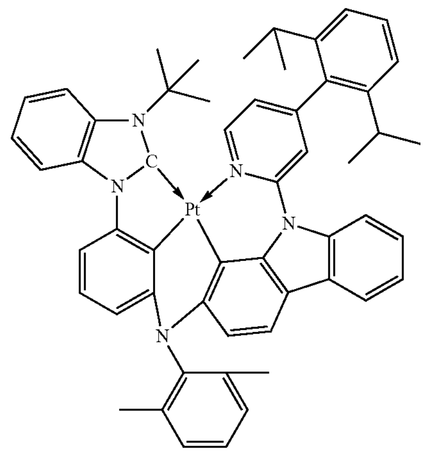
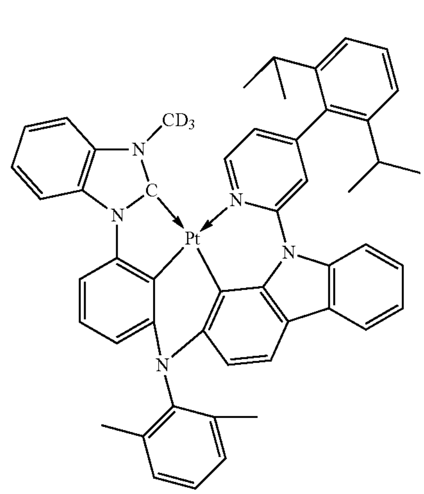
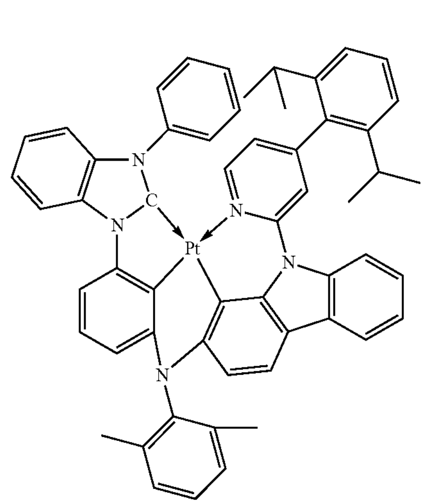

-continued
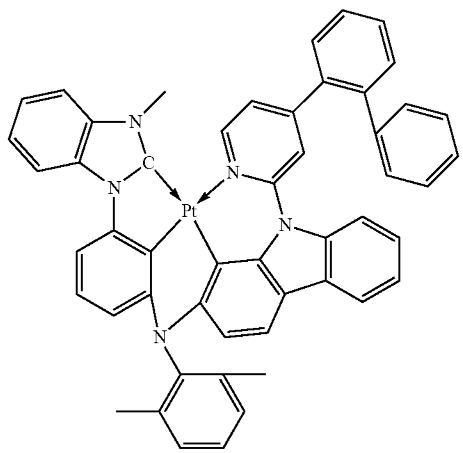
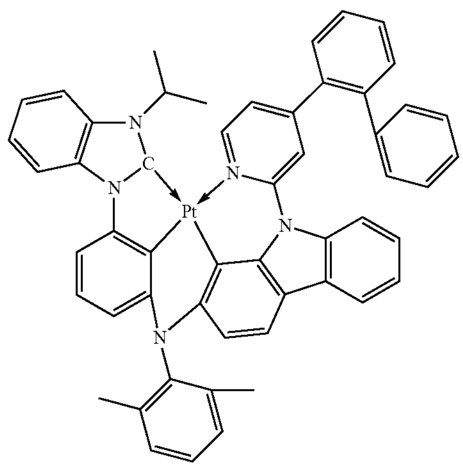
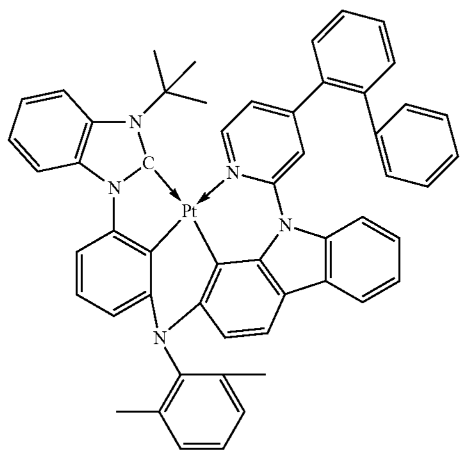
-continued
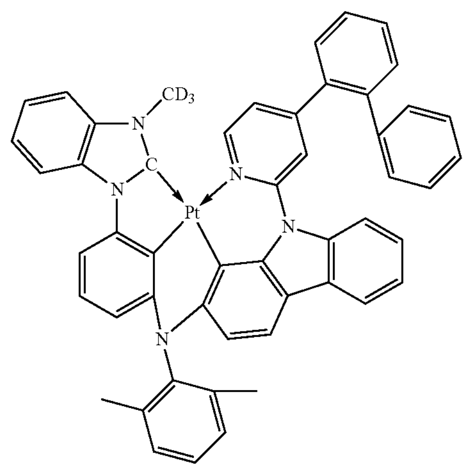
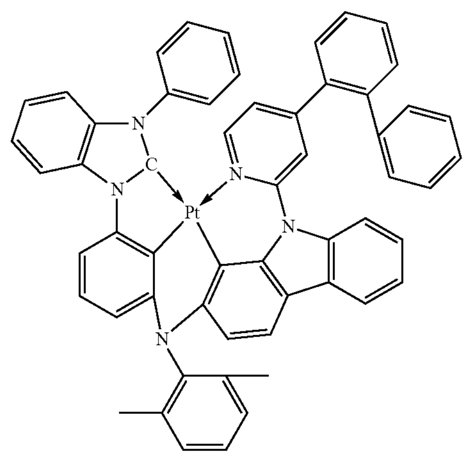
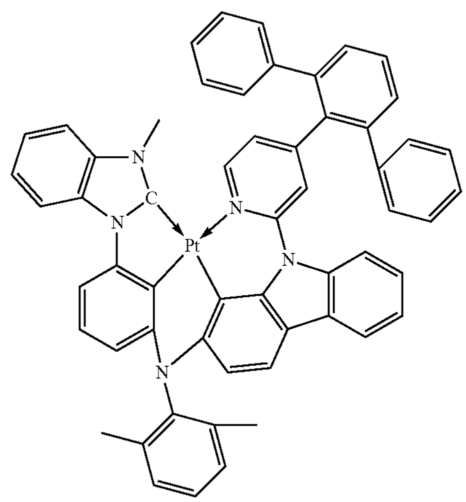

-continued
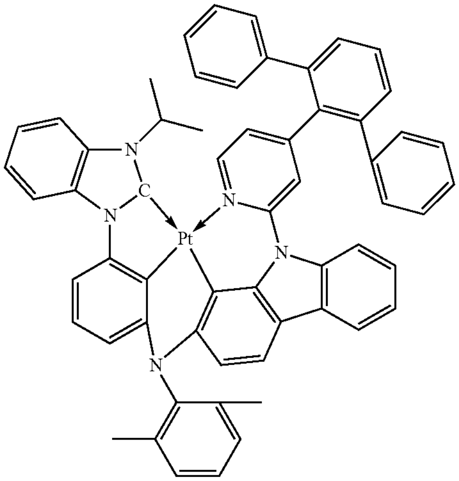
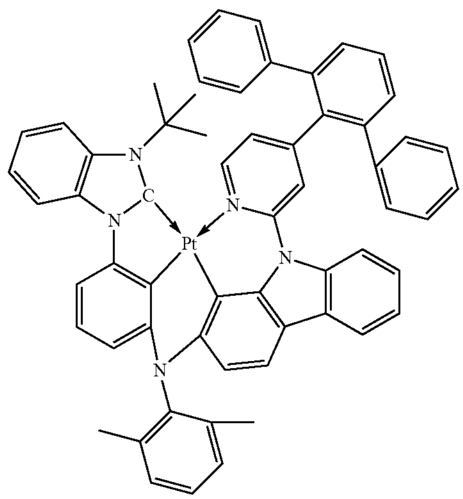
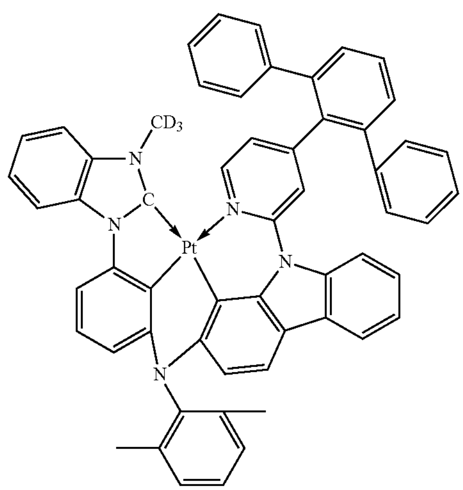
-continued
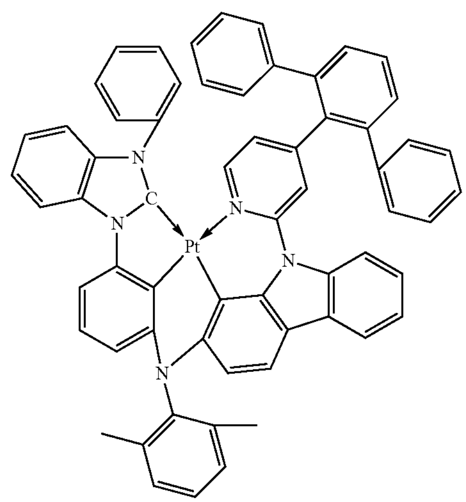
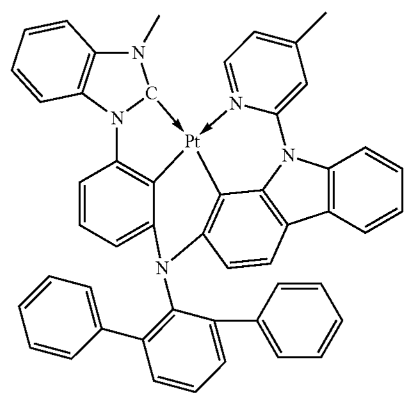
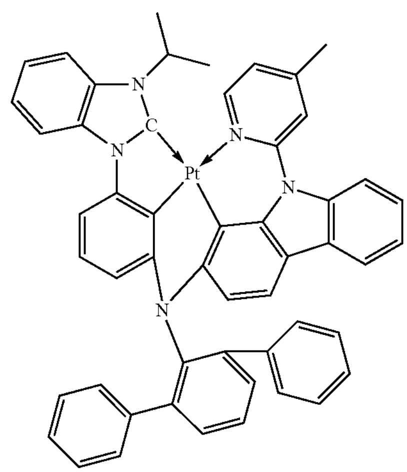

-continued
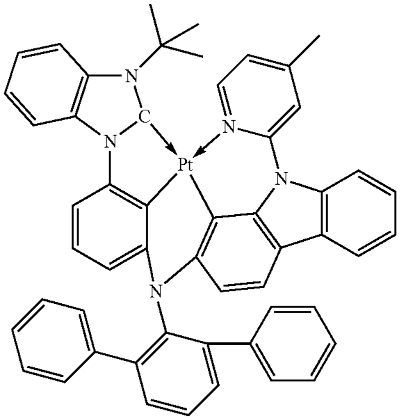
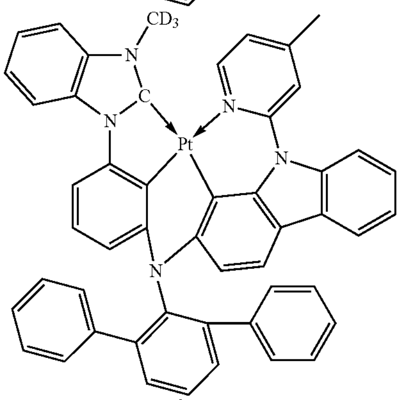
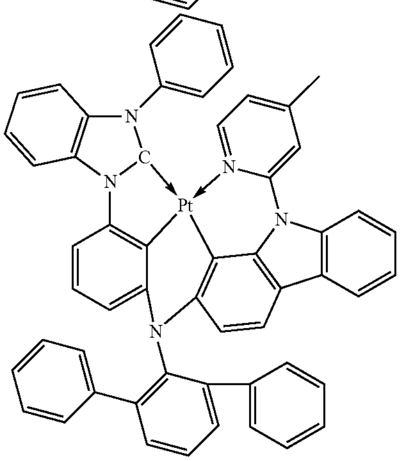
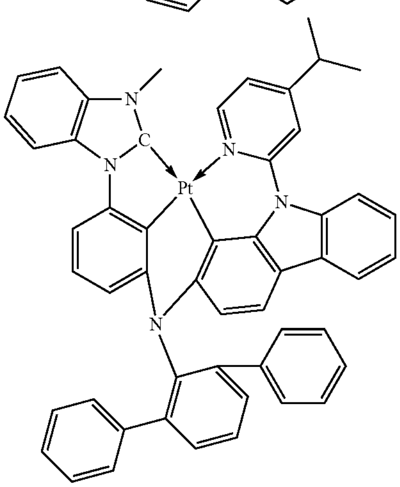
-continued
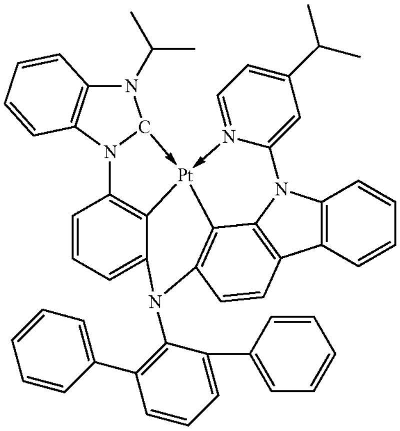
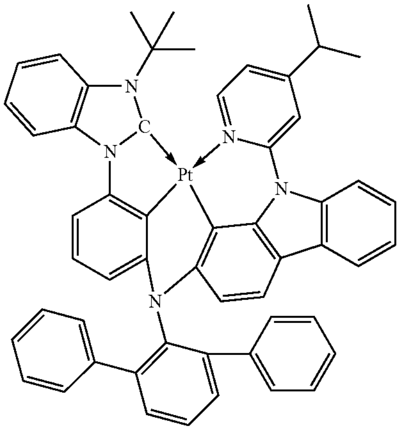
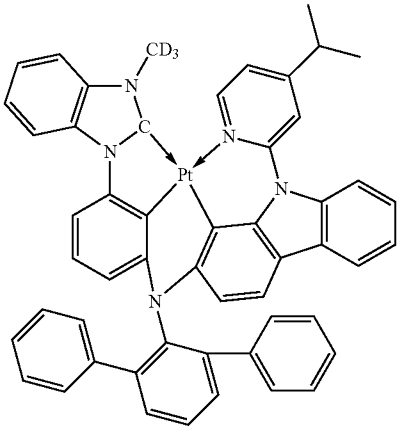

-continued
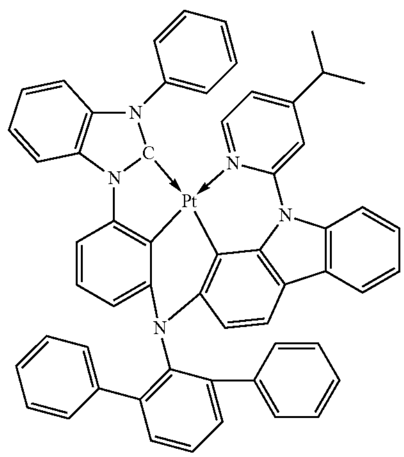
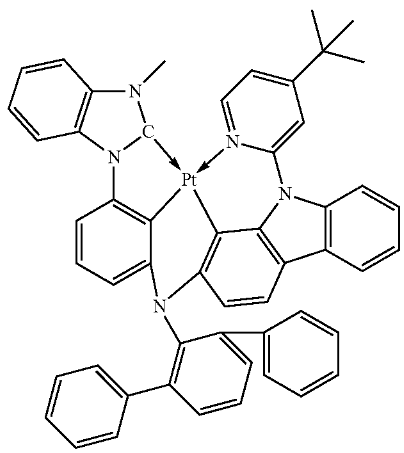
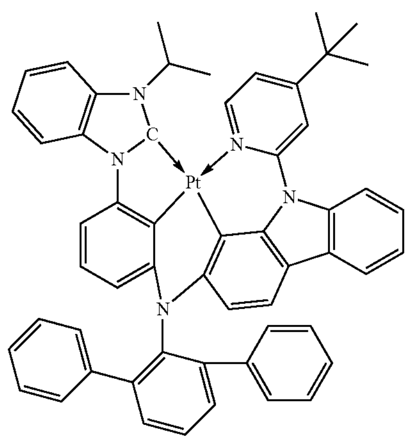
-continued
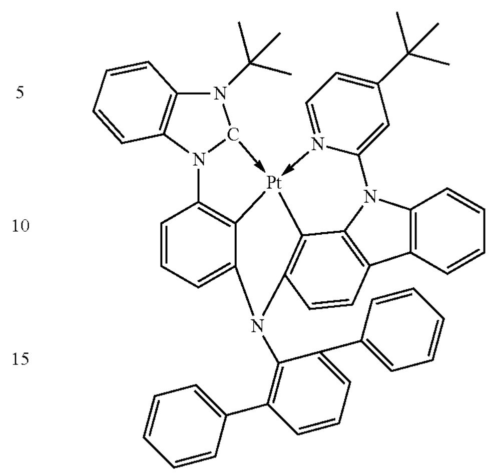
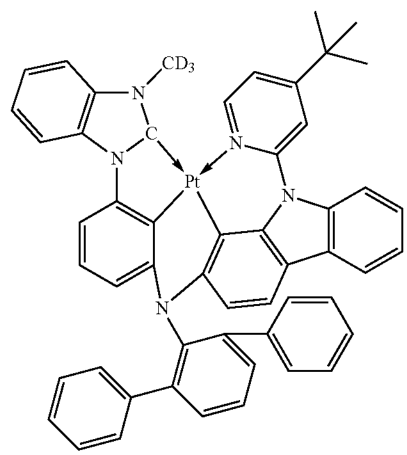
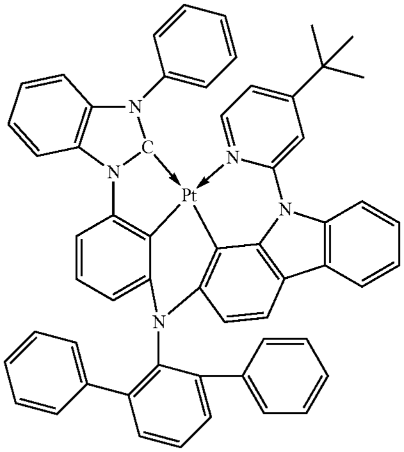

-continued
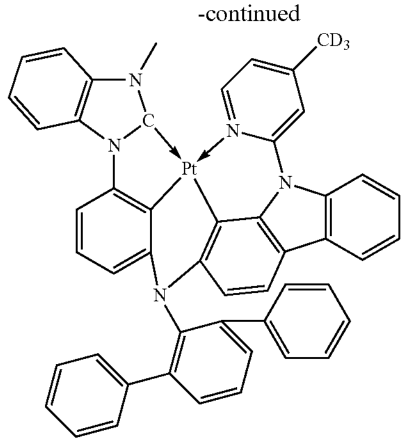
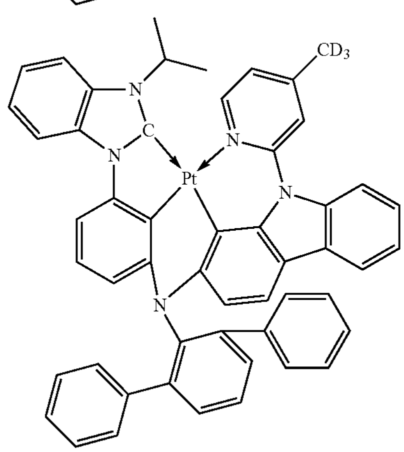
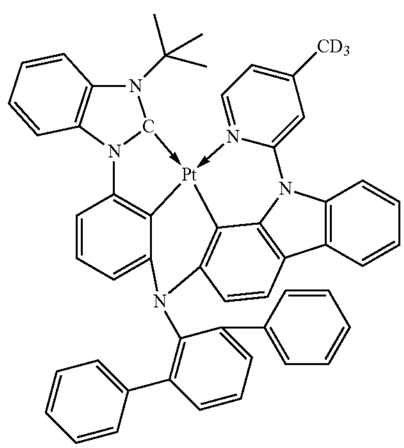
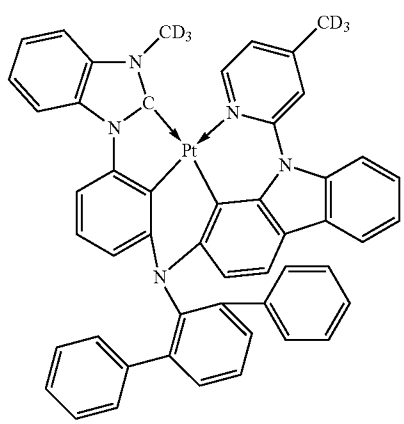
-continued
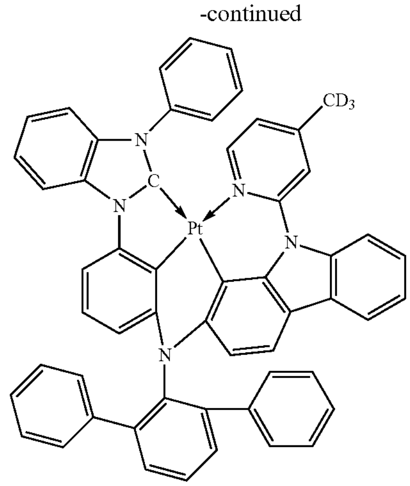
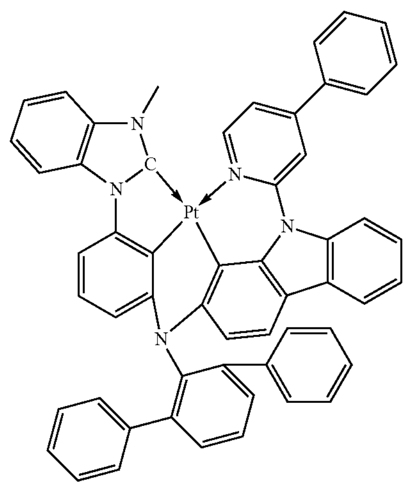
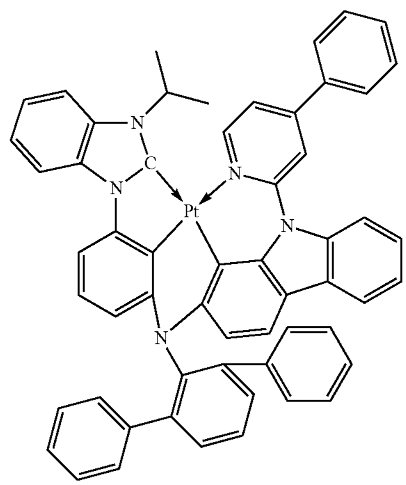

-continued
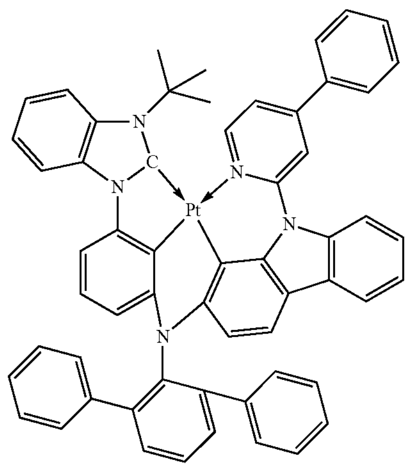
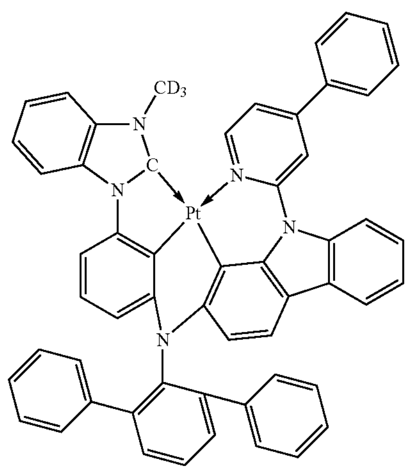
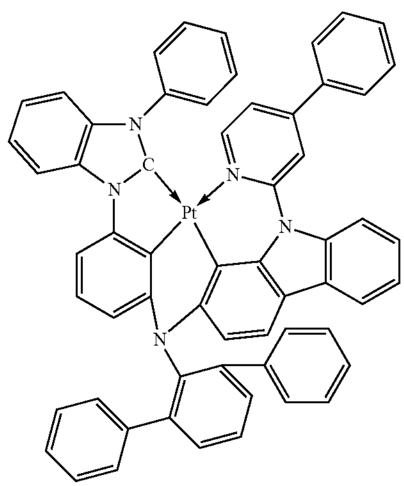
-continued
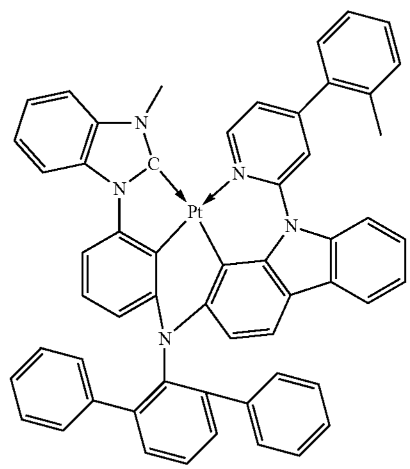
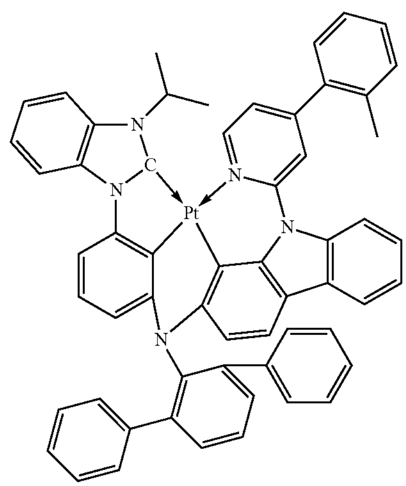
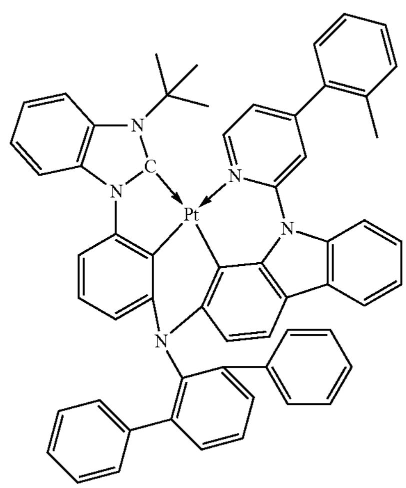

-continued
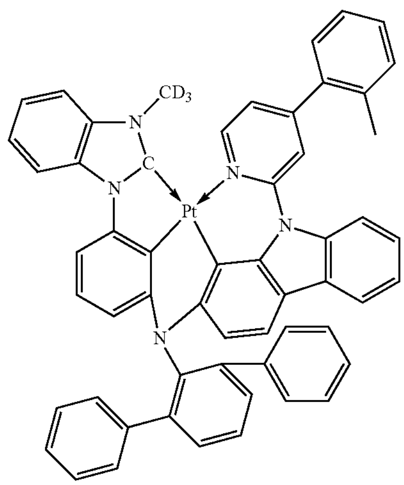
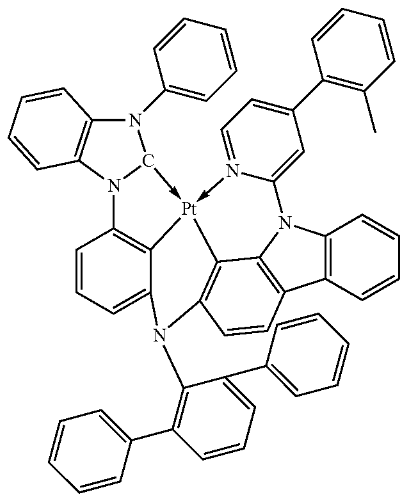
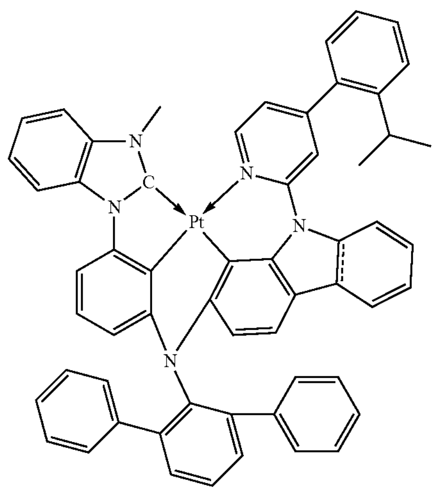
-continued
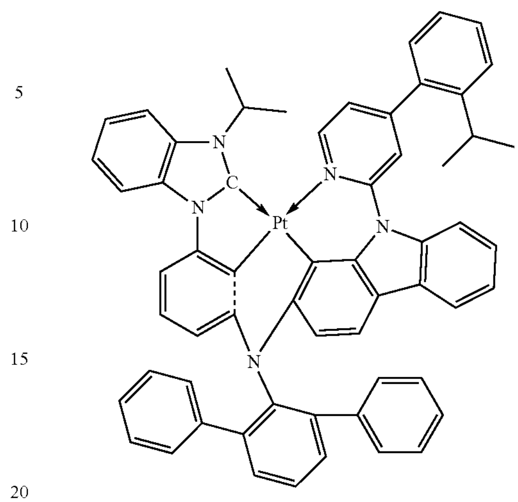
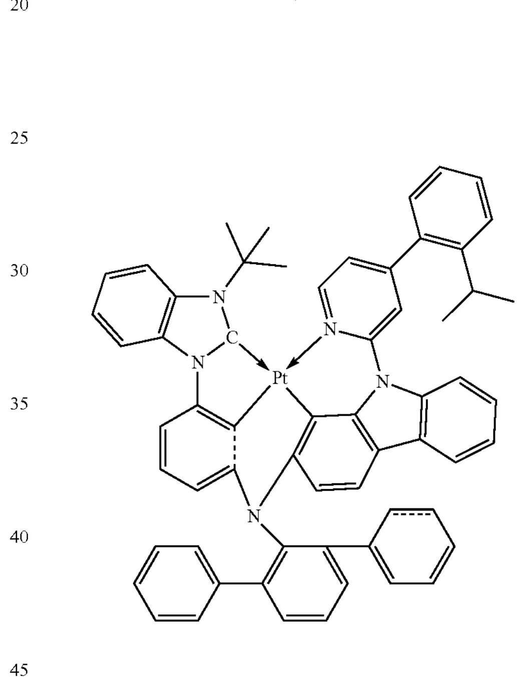
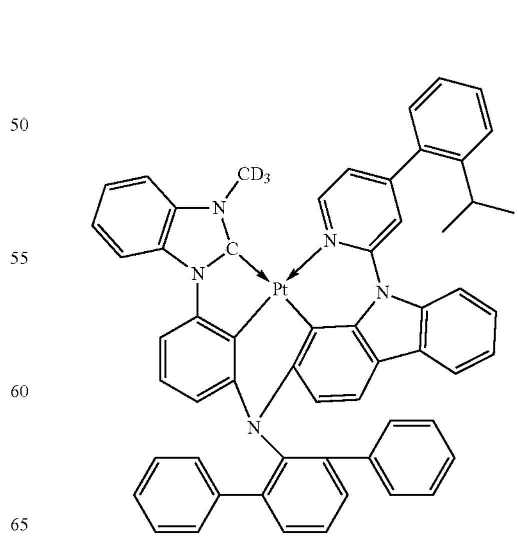

-continued
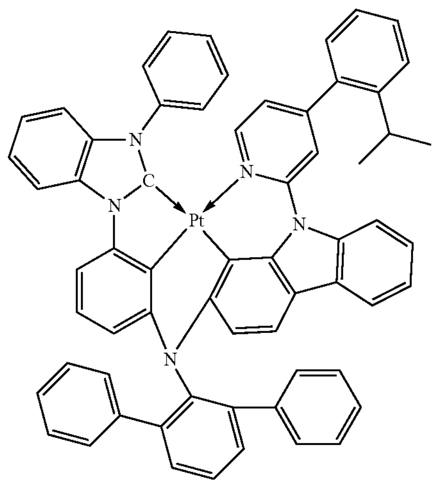
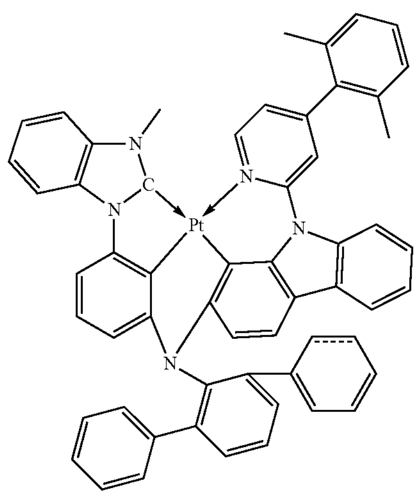
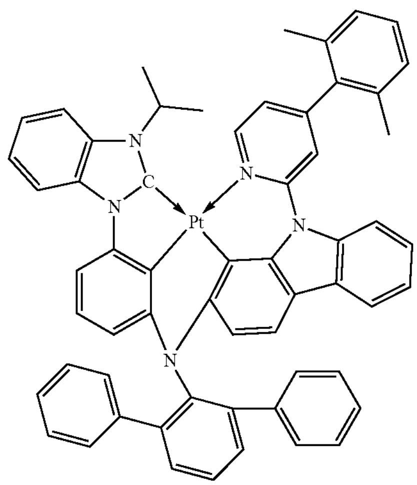
-continued
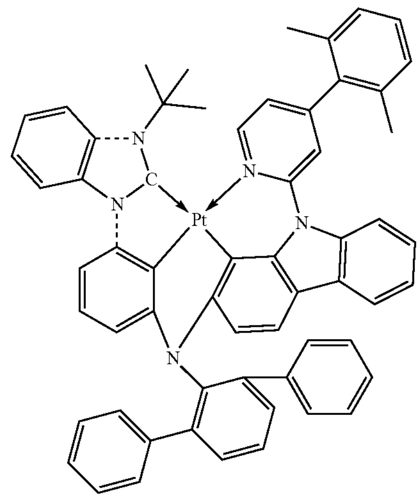
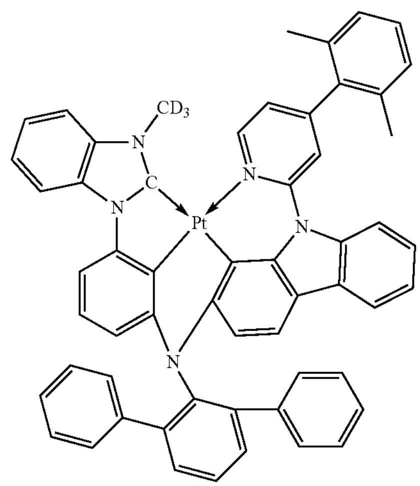
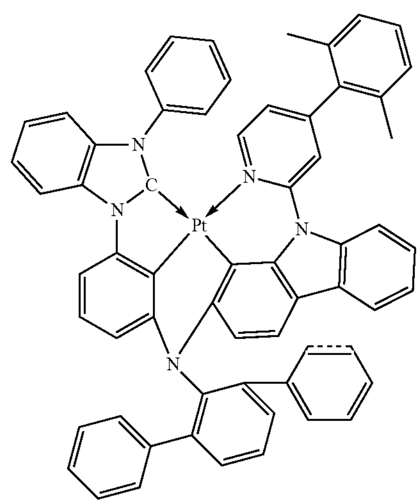

-continued
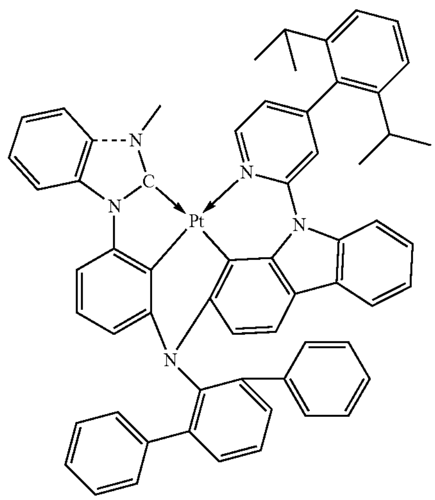
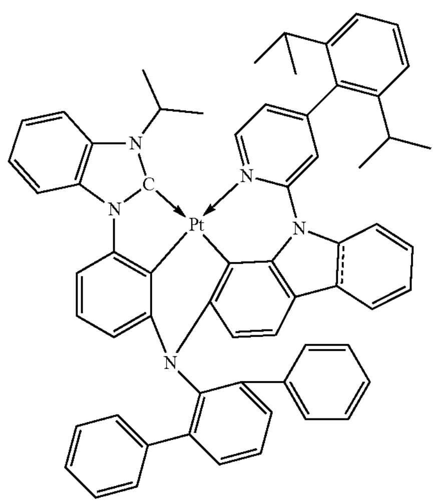
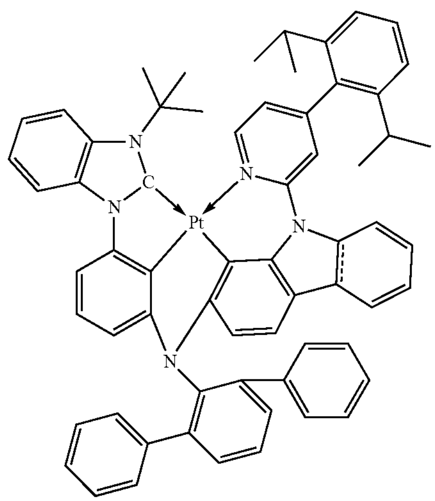
-continued
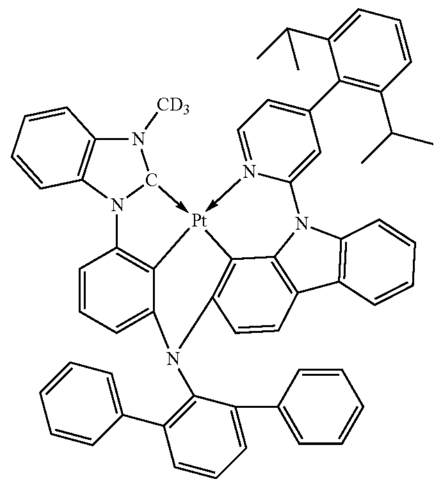
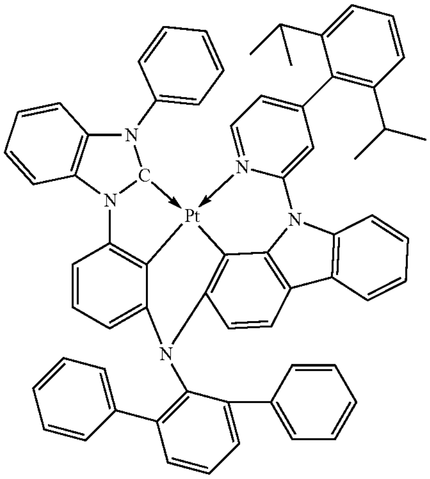
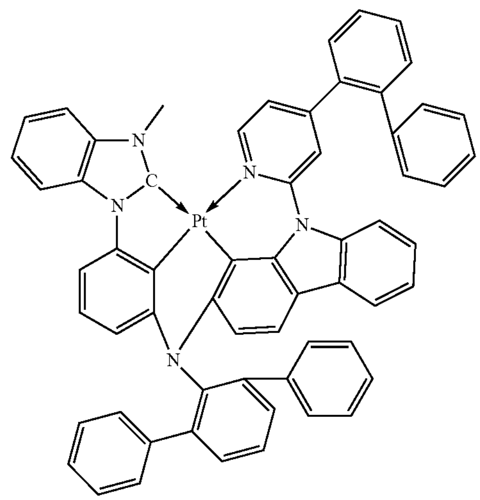

-continued
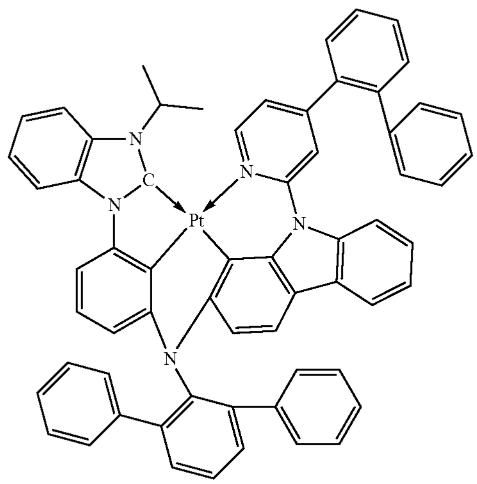
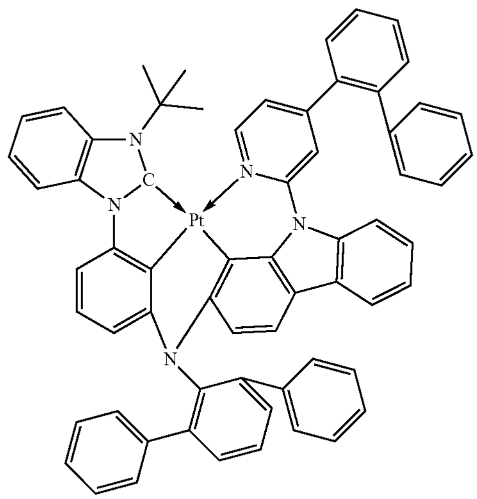
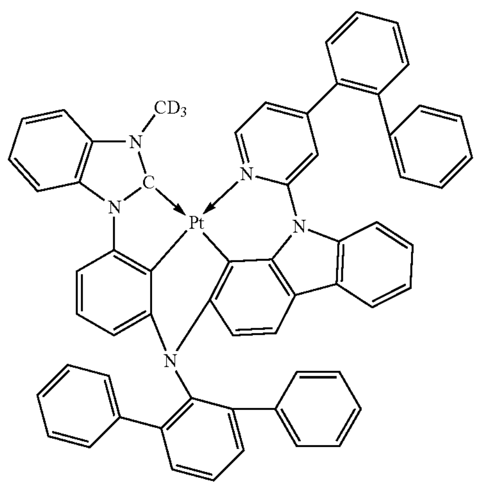
-continued
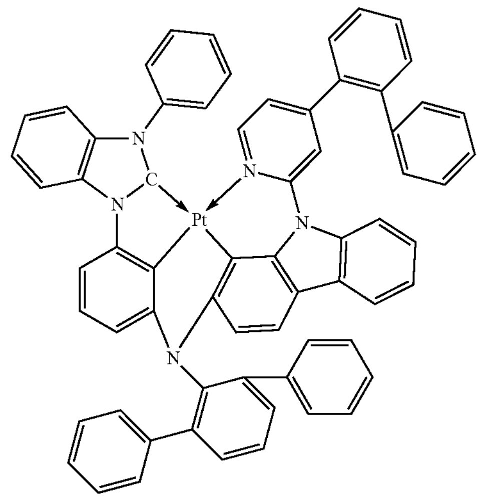
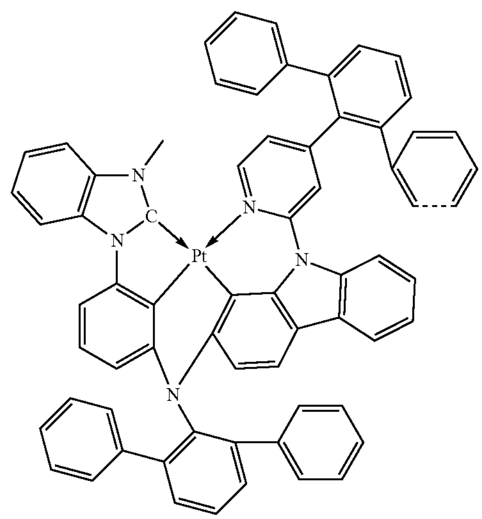
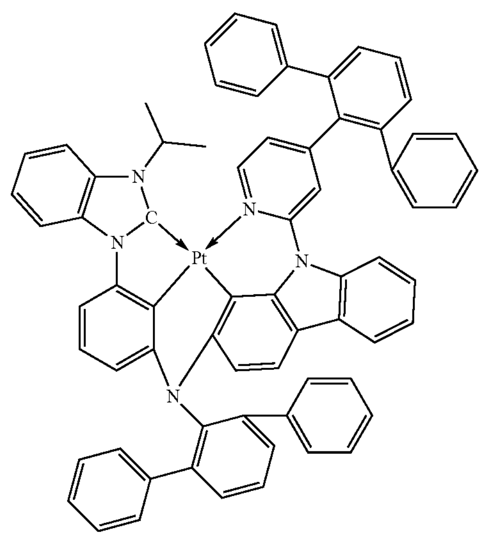

-continued
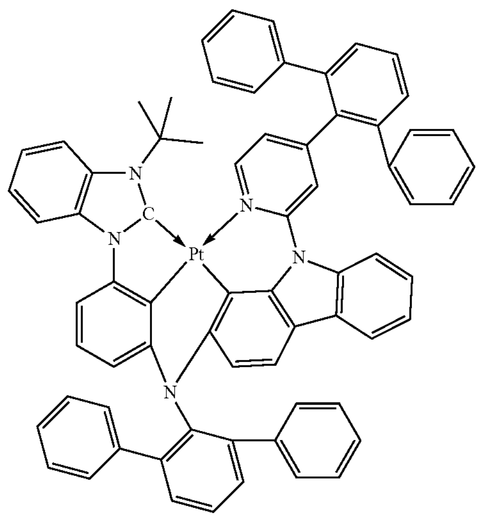
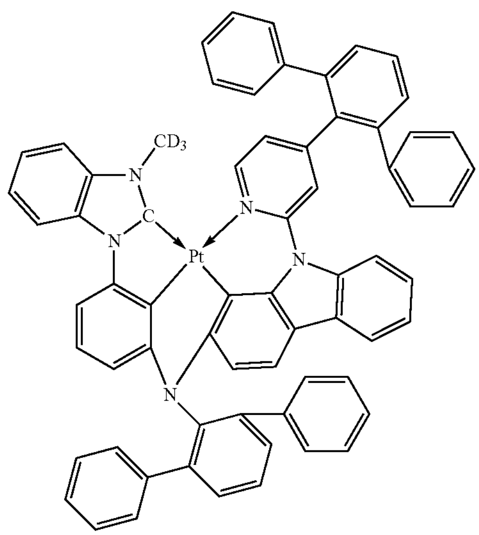
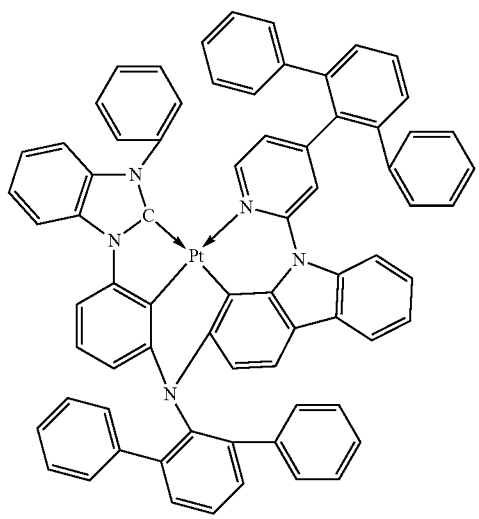
-continued
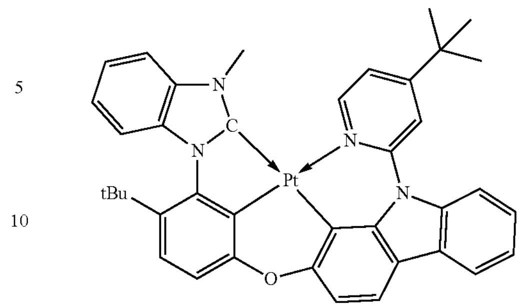
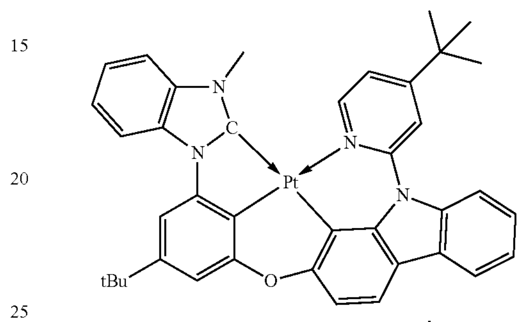
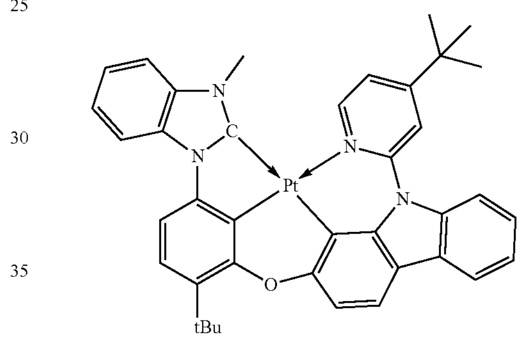
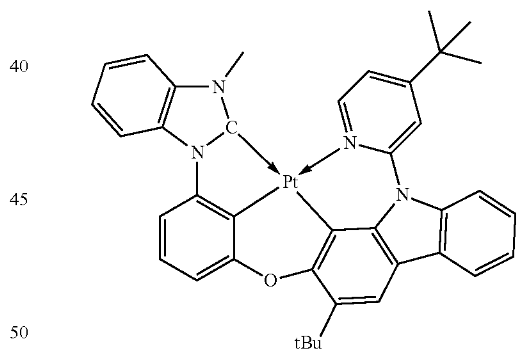
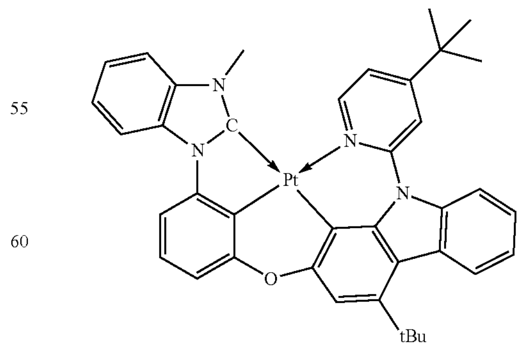

-continued
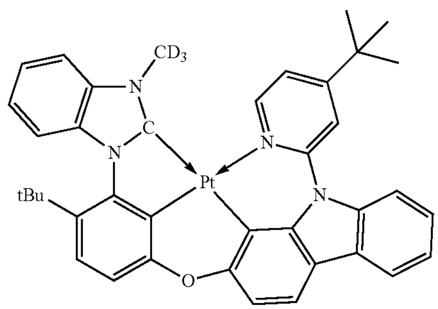
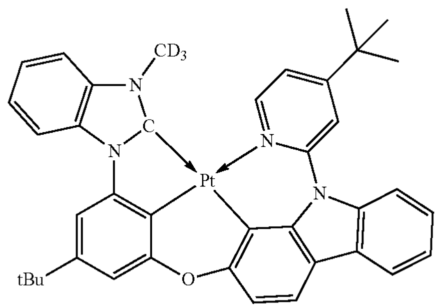
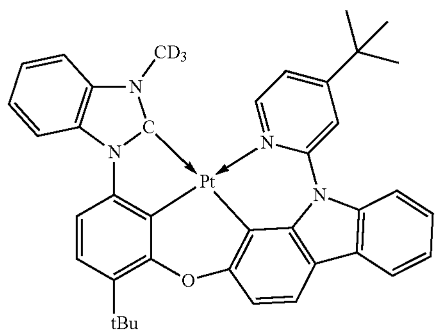
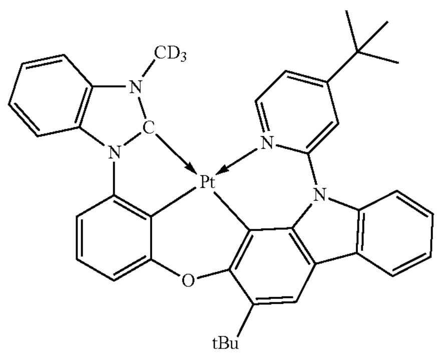
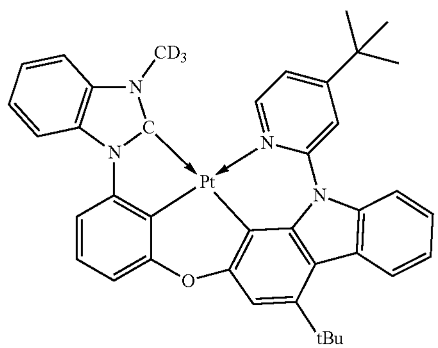
-continued
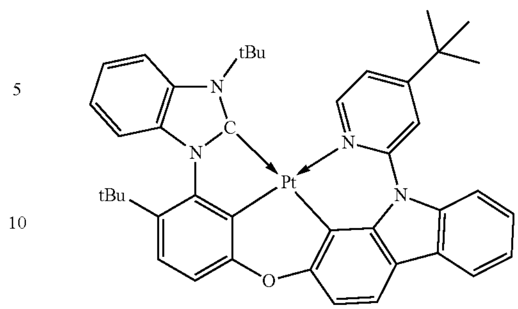
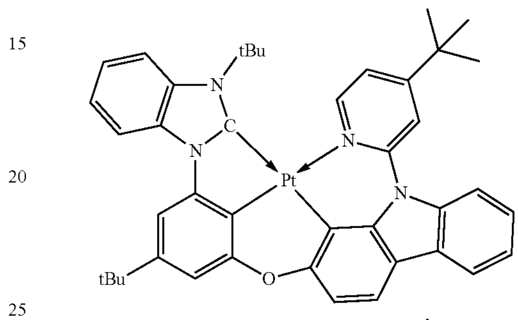
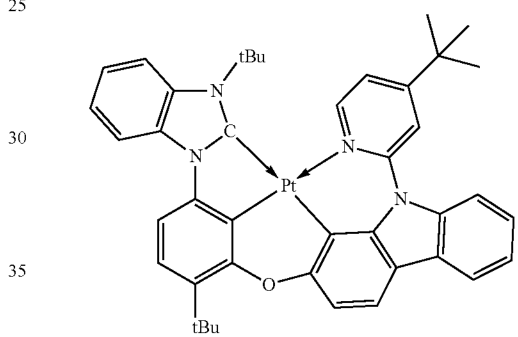
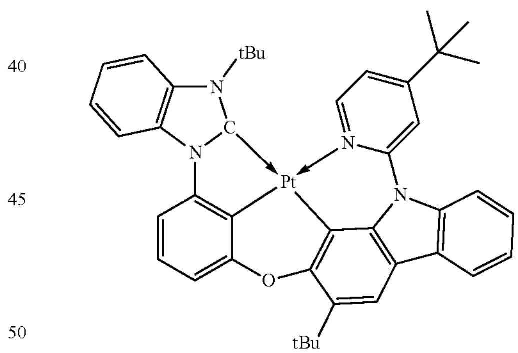
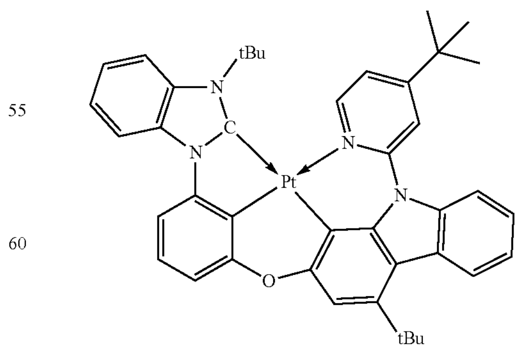

-continued
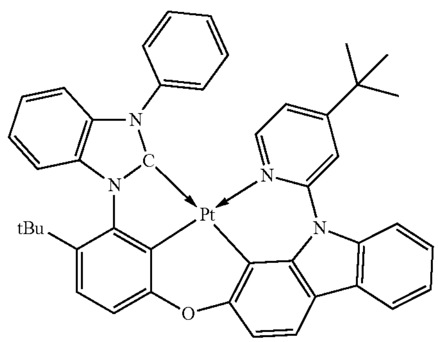
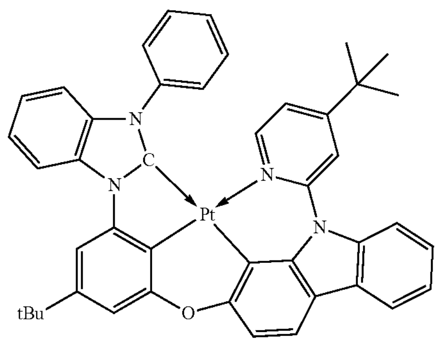
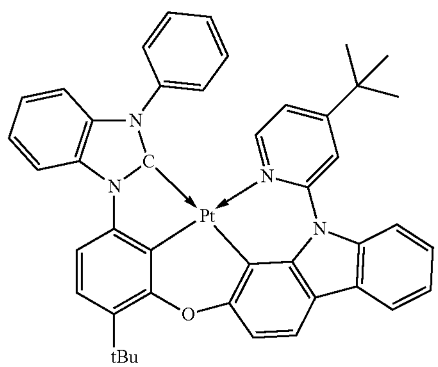
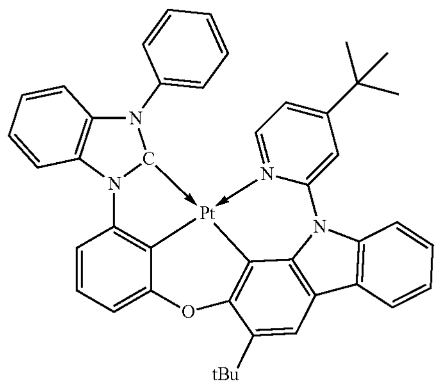
-continued
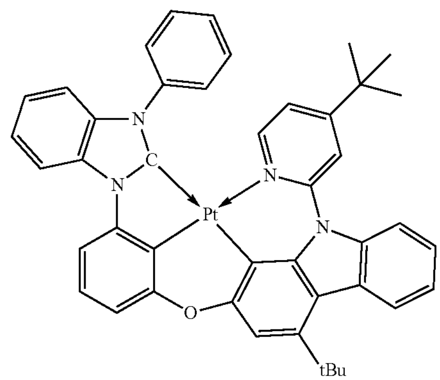
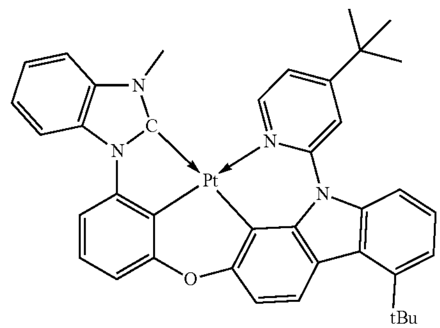
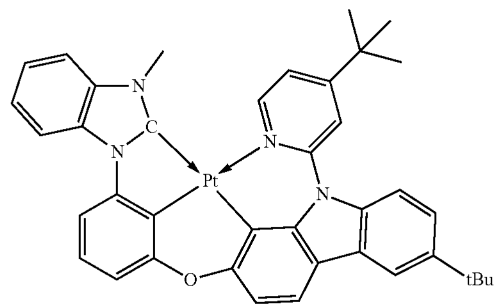
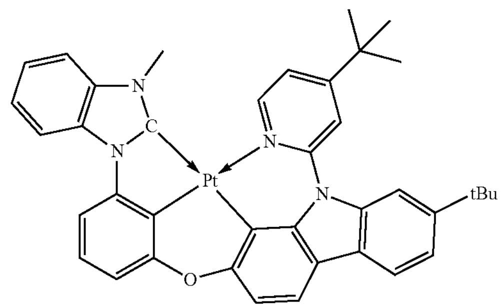
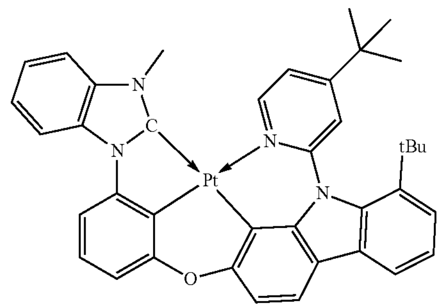

-continued
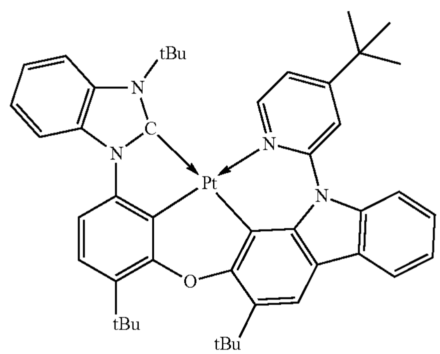
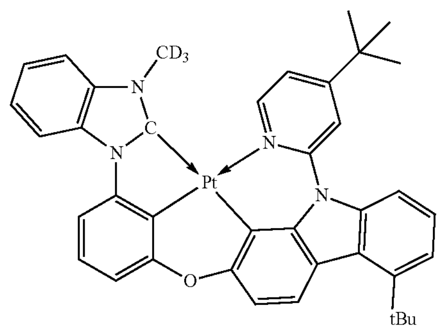
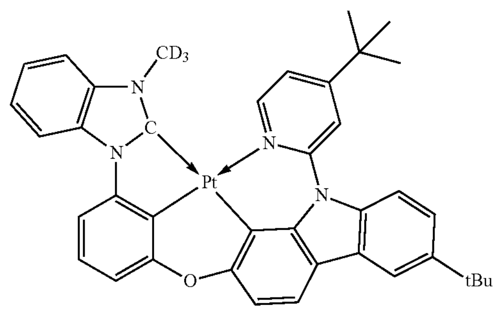
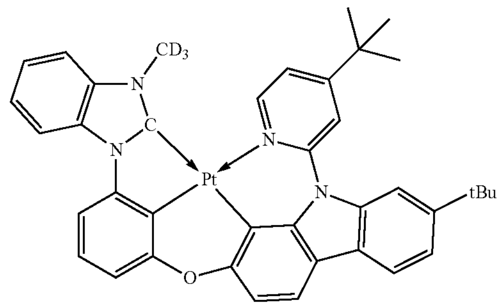
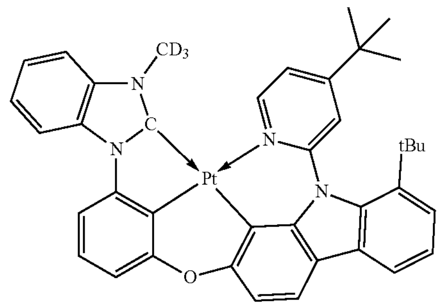
-continued
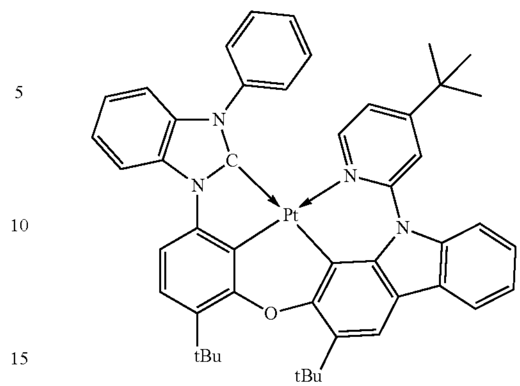
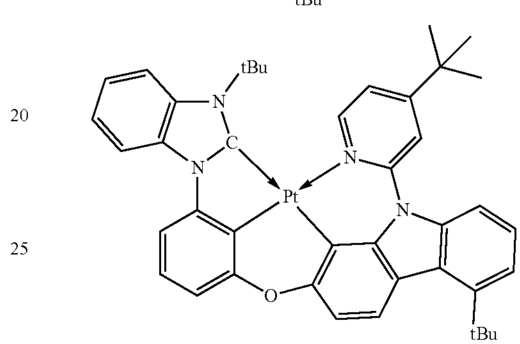
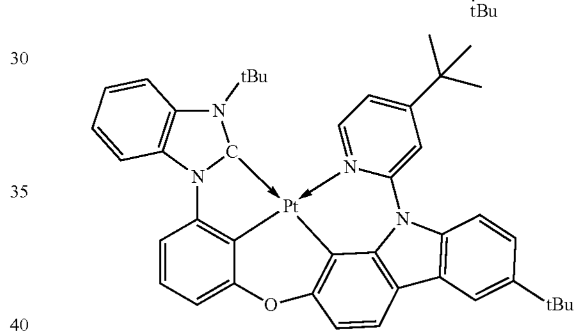
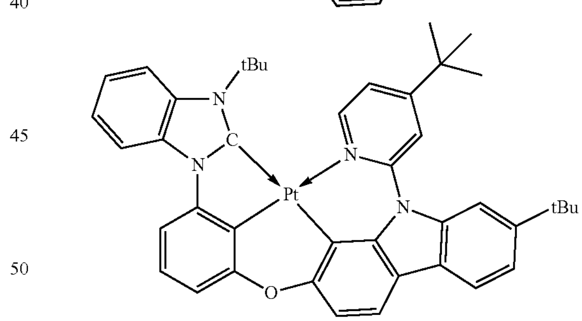
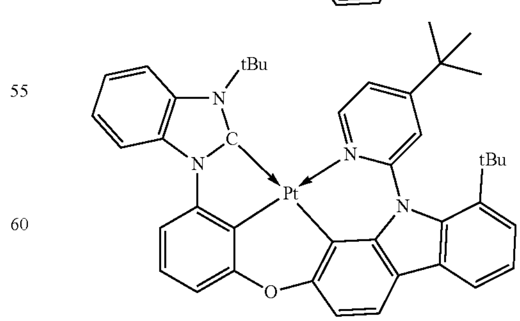
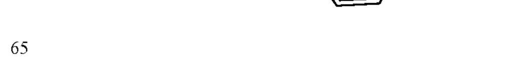
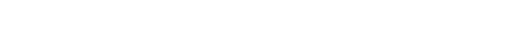
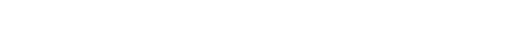
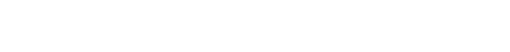
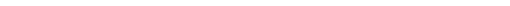

-continued
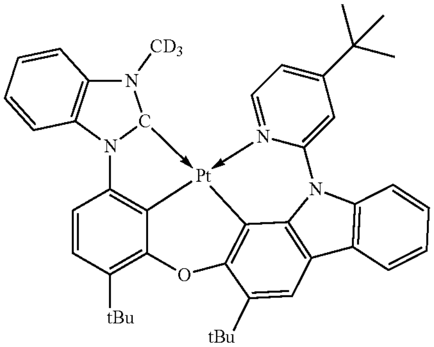
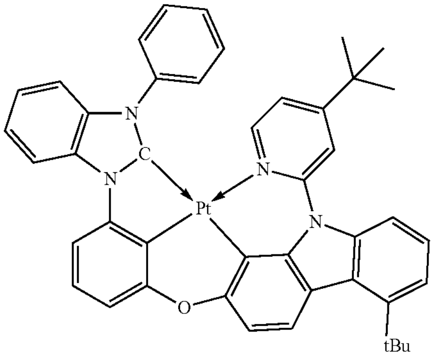
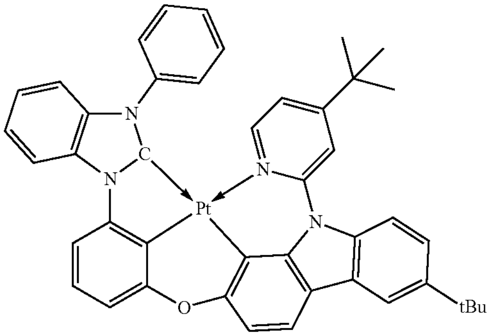
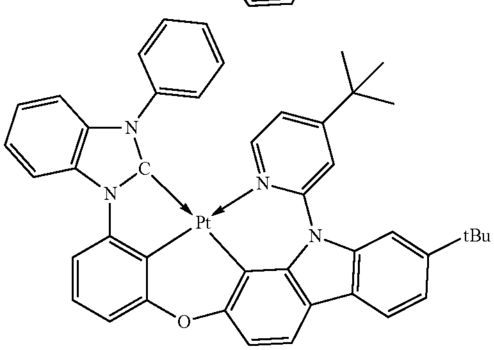
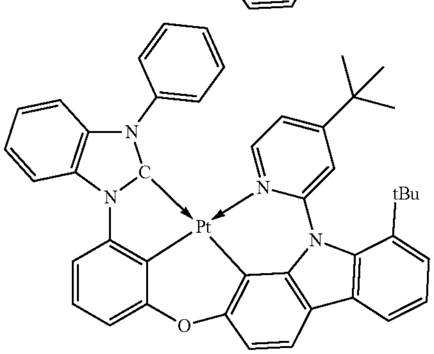
-continued
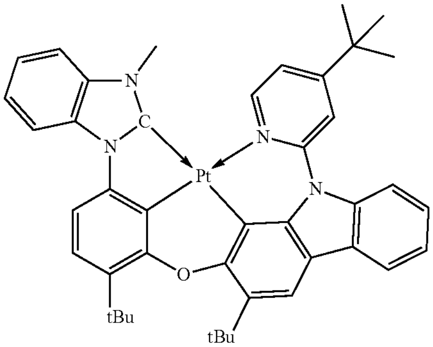
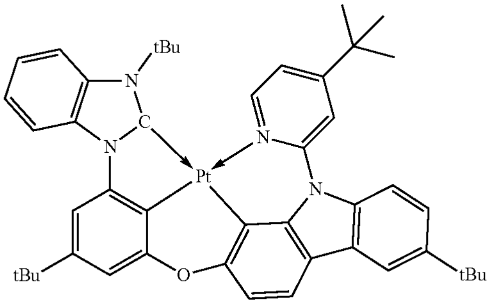
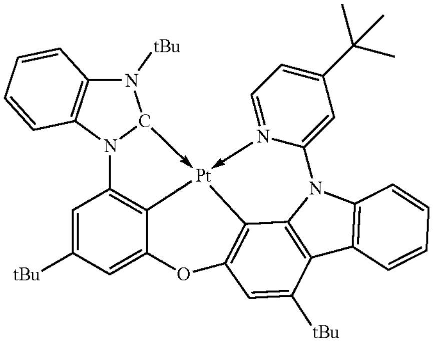
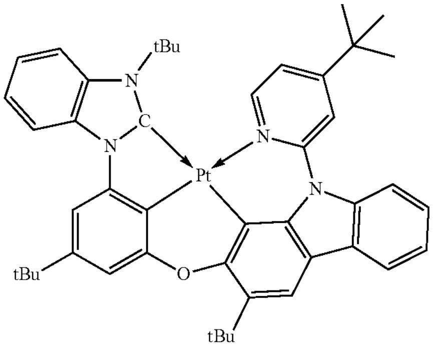
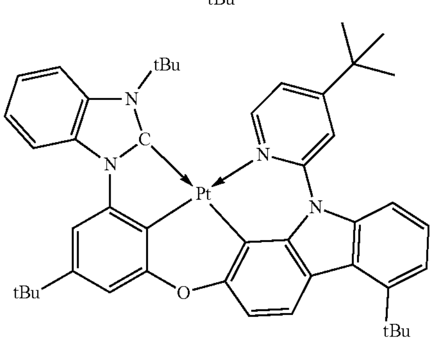

-continued
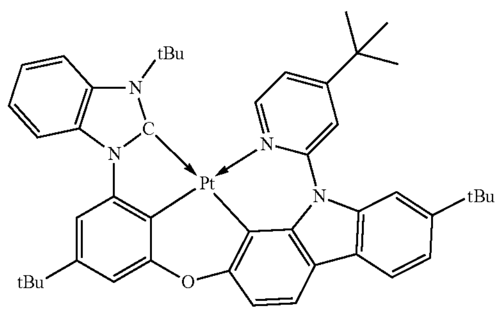
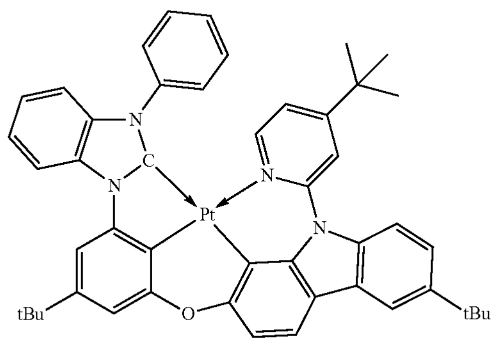
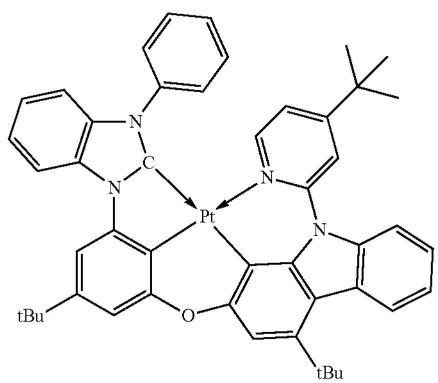
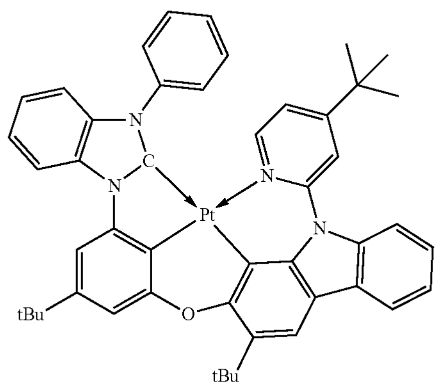
-continued
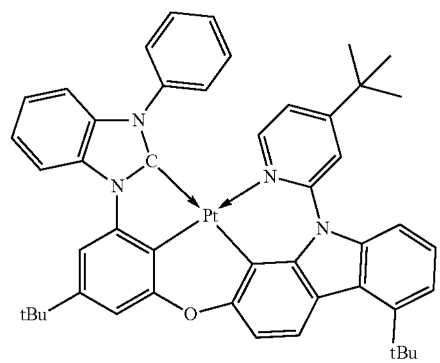
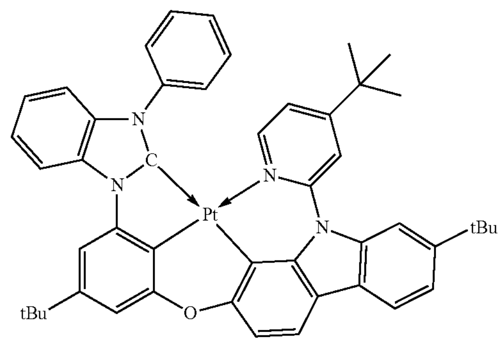
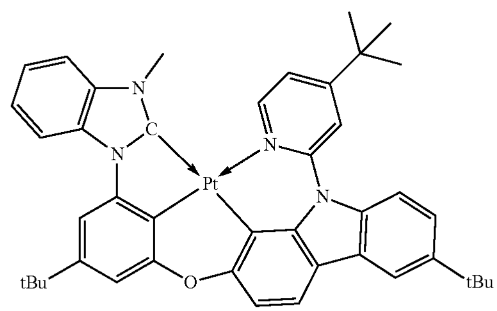
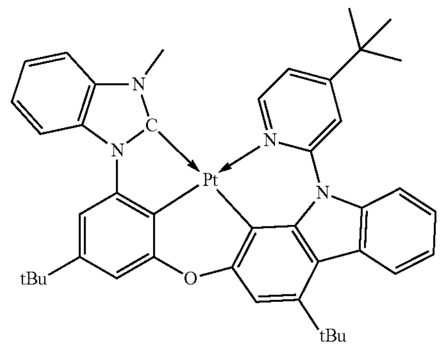
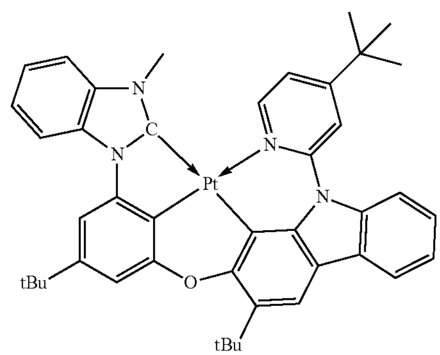

-continued
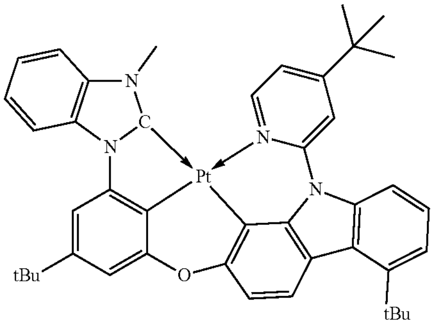
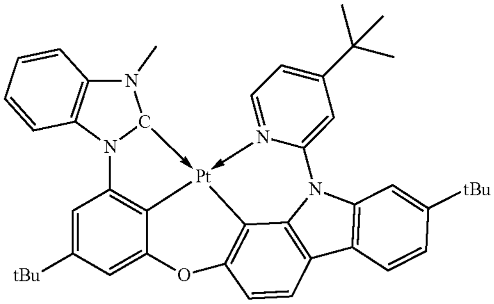
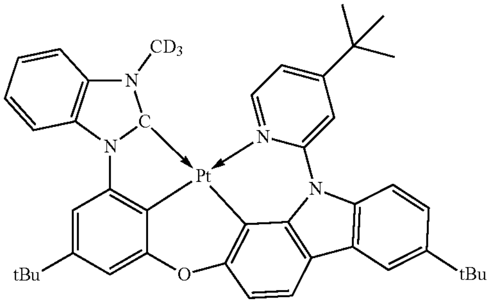
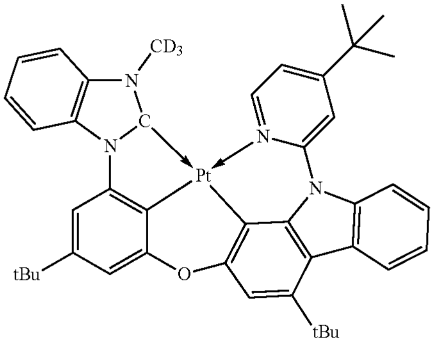
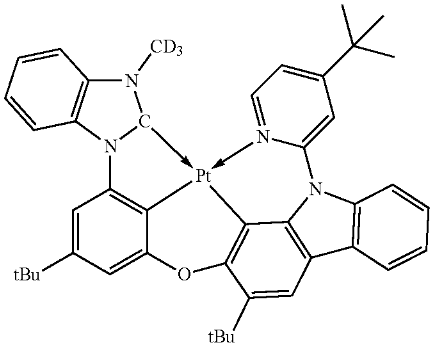
-continued
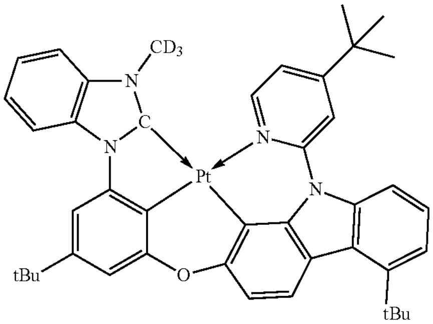
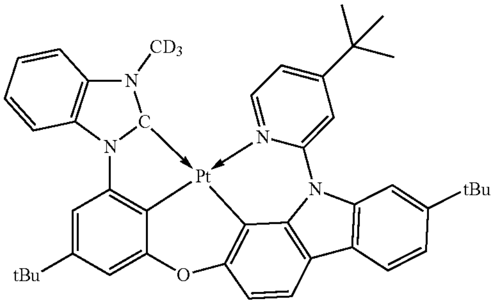
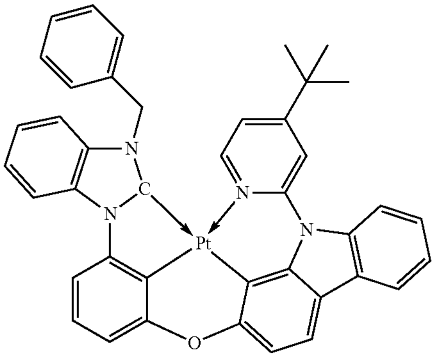
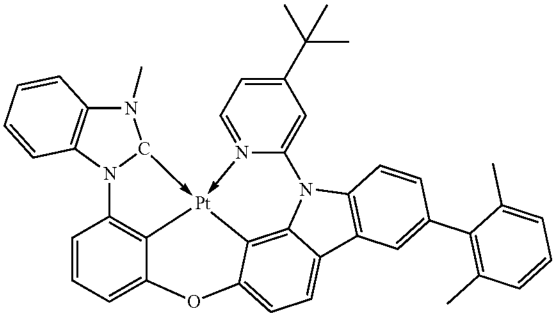
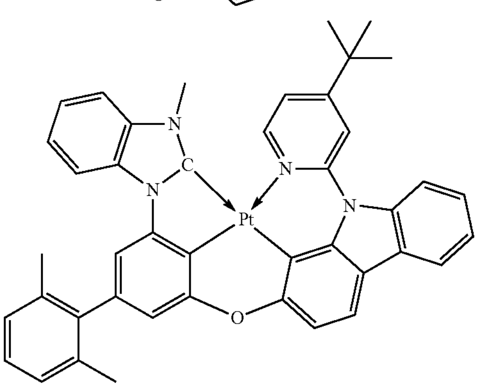

-continued
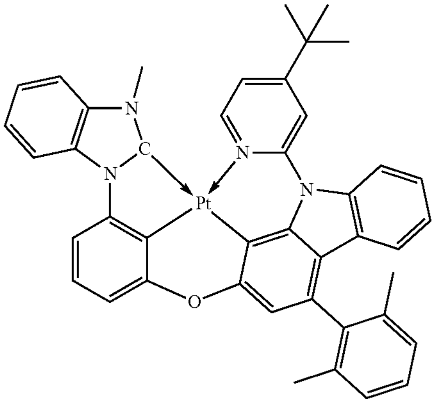
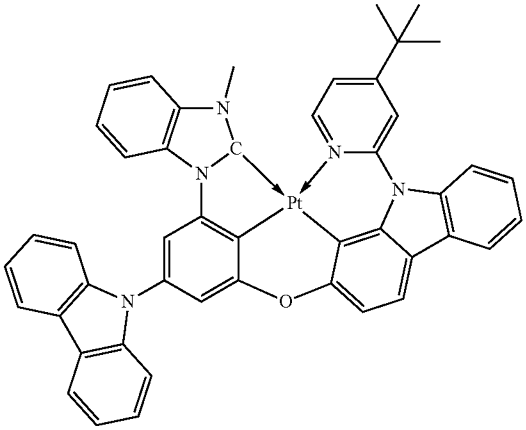
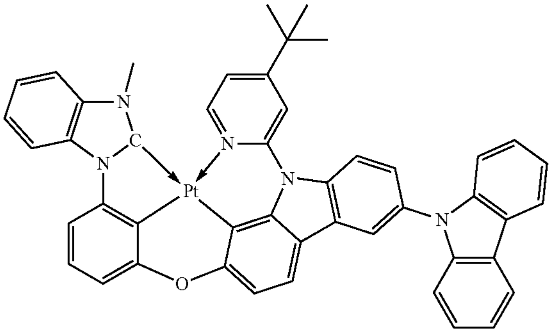
Group IV
1
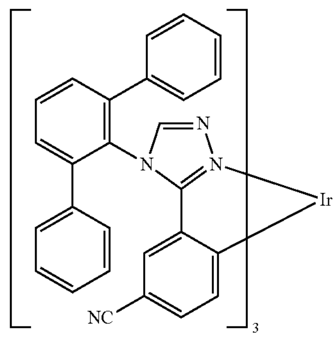
-continued
2
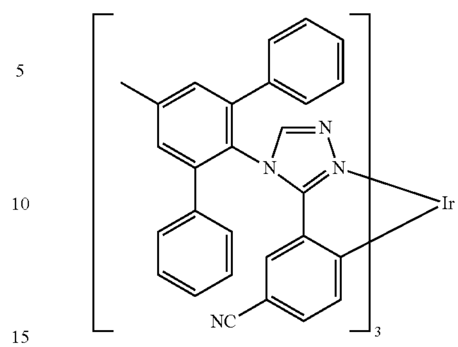
3
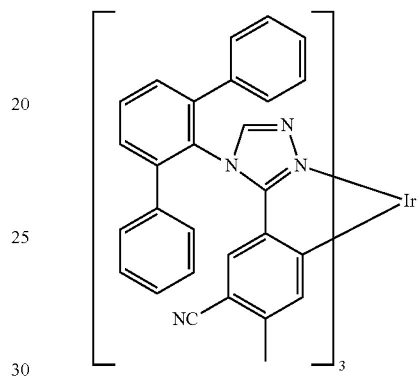
4
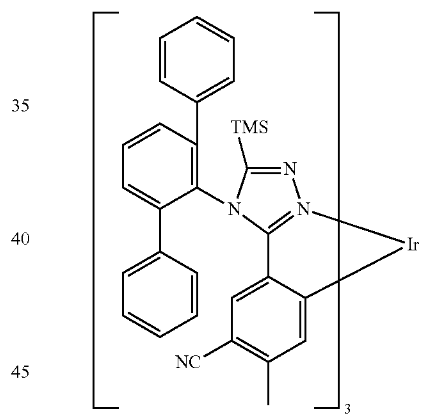
5
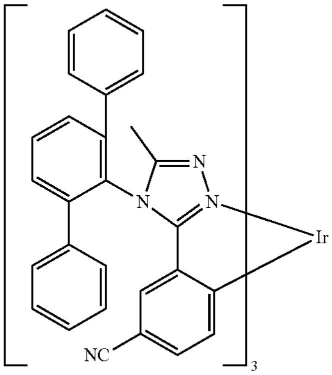

-continued

6

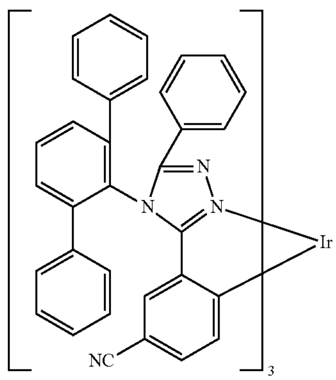

7

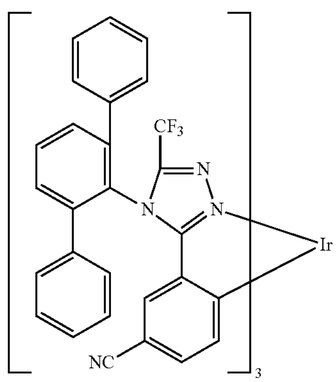

8

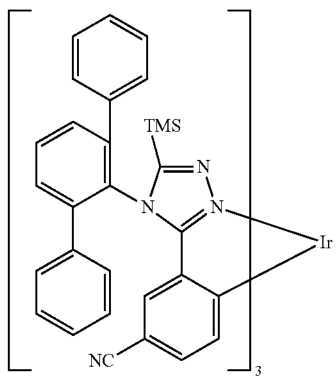

9

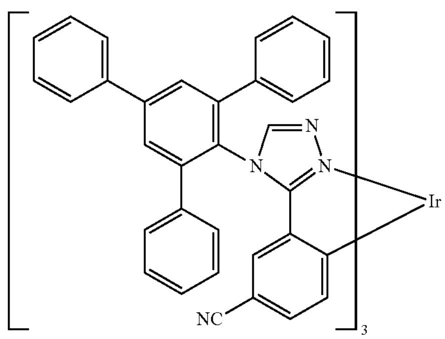

-continued

10

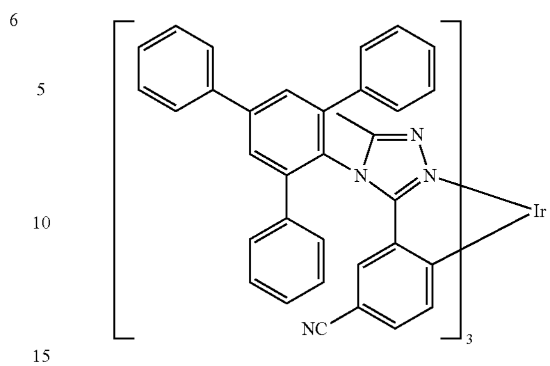

Group V a compound represented by Formula A:

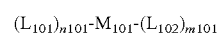

$(L_{101})_{n101}$-$M_{101}$-$(L_{102})_{m101}$ Formula A wherein, in Formula A, $L_{101}$, n101, $M_{101}$, $L_{102}$, and m101 may respectively be the same as described in Tables 2 to 4:

TABLE 2

| Compound name | $L_{101}$ | n101 | $M_{101}$ | $L_{102}$ | m101 |
|---|---|---|---|---|---|
| BD001 | LM1 | 3 | Ir | — | 0 |
| BD002 | LM2 | 3 | Ir | — | 0 |
| BD003 | LM3 | 3 | Ir | — | 0 |
| BD004 | LM4 | 3 | Ir | — | 0 |
| BD005 | LM5 | 3 | Ir | — | 0 |
| BD006 | LM6 | 3 | Ir | — | 0 |
| BD007 | LM7 | 3 | Ir | — | 0 |
| BD008 | LM8 | 3 | Ir | — | 0 |
| BD009 | LM9 | 3 | Ir | — | 0 |
| BD010 | LM10 | 3 | Ir | — | 0 |
| BD011 | LM11 | 3 | Ir | — | 0 |
| BD012 | LM12 | 3 | Ir | — | 0 |
| BD013 | LM13 | 3 | Ir | — | 0 |
| BD014 | LM14 | 3 | Ir | — | 0 |
| BD015 | LM15 | 3 | Ir | — | 0 |
| BD016 | LM16 | 3 | Ir | — | 0 |
| BD017 | LM17 | 3 | Ir | — | 0 |
| BD018 | LM18 | 3 | Ir | — | 0 |
| BD019 | LM19 | 3 | Ir | — | 0 |
| BD020 | LM20 | 3 | Ir | — | 0 |
| BD021 | LM21 | 3 | Ir | — | 0 |
| BD022 | LM22 | 3 | Ir | — | 0 |
| BD023 | LM23 | 3 | Ir | — | 0 |
| BD024 | LM24 | 3 | Ir | — | 0 |
| BD025 | LM25 | 3 | Ir | — | 0 |
| BD026 | LM26 | 3 | Ir | — | 0 |
| BD027 | LM27 | 3 | Ir | — | 0 |
| BD028 | LM28 | 3 | Ir | — | 0 |
| BD029 | LM29 | 3 | Ir | — | 0 |
| BD030 | LM30 | 3 | Ir | — | 0 |
| BD031 | LM31 | 3 | Ir | — | 0 |
| BD032 | LM32 | 3 | Ir | — | 0 |
| BD033 | LM33 | 3 | Ir | — | 0 |
| BD034 | LM34 | 3 | Ir | — | 0 |
| BD035 | LM35 | 3 | Ir | — | 0 |
| BD036 | LM36 | 3 | Ir | — | 0 |
| BD037 | LM37 | 3 | Ir | — | 0 |
| BD038 | LM38 | 3 | Ir | — | 0 |
| BD039 | LM39 | 3 | Ir | — | 0 |
| BD040 | LM40 | 3 | Ir | — | 0 |
| BD041 | LM41 | 3 | Ir | — | 0 |
| BD042 | LM42 | 3 | Ir | — | 0 |
| BD043 | LM43 | 3 | Ir | — | 0 |
| BD044 | LM44 | 3 | Ir | — | 0 |
| BD045 | LM45 | 3 | Ir | — | 0 |
| BD046 | LM46 | 3 | Ir | — | 0 |
| BD047 | LM47 | 3 | Ir | — | 0 |
| BD048 | LM48 | 3 | Ir | — | 0 |

TABLE 2-continued

| Compound name | $L_{101}$ | n101 | $M_{101}$ | $L_{102}$ | m101 |
|---|---|---|---|---|---|
| BD049 | LM49 | 3 | Ir | — | 0 |
| BD050 | LM50 | 3 | Ir | — | 0 |
| BD051 | LM51 | 3 | Ir | — | 0 |
| BD052 | LM52 | 3 | Ir | — | 0 |
| BD053 | LM53 | 3 | Ir | — | 0 |
| BD054 | LM54 | 3 | Ir | — | 0 |
| BD055 | LM55 | 3 | Ir | — | 0 |
| BD056 | LM56 | 3 | Ir | — | 0 |
| BD057 | LM57 | 3 | Ir | — | 0 |
| BD058 | LM58 | 3 | Ir | — | 0 |
| BD059 | LM59 | 3 | Ir | — | 0 |
| BD060 | LM60 | 3 | Ir | — | 0 |
| BD061 | LM61 | 3 | Ir | — | 0 |
| BD062 | LM62 | 3 | Ir | — | 0 |
| BD063 | LM63 | 3 | Ir | — | 0 |
| BD064 | LM64 | 3 | Ir | — | 0 |
| BD065 | LM65 | 3 | Ir | — | 0 |
| BD066 | LM66 | 3 | Ir | — | 0 |
| BD067 | LM67 | 3 | Ir | — | 0 |
| BD068 | LM68 | 3 | Ir | — | 0 |
| BD069 | LM69 | 3 | Ir | — | 0 |
| BD070 | LM70 | 3 | Ir | — | 0 |
| BD071 | LM71 | 3 | Ir | — | 0 |
| BD072 | LM72 | 3 | Ir | — | 0 |
| BD073 | LM73 | 3 | Ir | — | 0 |
| BD074 | LM74 | 3 | Ir | — | 0 |
| BD075 | LM75 | 3 | Ir | — | 0 |
| BD076 | LM76 | 3 | Ir | — | 0 |
| BD077 | LM77 | 3 | Ir | — | 0 |
| BD078 | LM78 | 3 | Ir | — | 0 |
| BD079 | LM79 | 3 | Ir | — | 0 |
| BD080 | LM80 | 3 | Ir | — | 0 |
| BD081 | LM81 | 3 | Ir | — | 0 |
| BD082 | LM82 | 3 | Ir | — | 0 |
| BD083 | LM83 | 3 | Ir | — | 0 |
| BD084 | LM84 | 3 | Ir | — | 0 |
| BD085 | LM85 | 3 | Ir | — | 0 |
| BD086 | LM86 | 3 | Ir | — | 0 |
| BD087 | LM87 | 3 | Ir | — | 0 |
| BD088 | LM88 | 3 | Ir | — | 0 |
| BD089 | LM89 | 3 | Ir | — | 0 |
| BD090 | LM90 | 3 | Ir | — | 0 |
| BD091 | LM91 | 3 | Ir | — | 0 |
| BD092 | LM92 | 3 | Ir | — | 0 |
| BD093 | LM93 | 3 | Ir | — | 0 |
| BD094 | LM94 | 3 | Ir | — | 0 |
| BD095 | LM95 | 3 | Ir | — | 0 |
| BD096 | LM96 | 3 | Ir | — | 0 |
| BD097 | LM97 | 3 | Ir | — | 0 |
| BD098 | LM98 | 3 | Ir | — | 0 |
| BD099 | LM99 | 3 | Ir | — | 0 |
| BD100 | LM100 | 3 | Ir | — | 0 |

TABLE 3

| Compound name | $L_{101}$ | n101 | $M_{101}$ | $L_{102}$ | m101 |
|---|---|---|---|---|---|
| BD101 | LM101 | 3 | Ir | — | 0 |
| BD102 | LM102 | 3 | Ir | — | 0 |
| BD103 | LM103 | 3 | Ir | — | 0 |
| BD104 | LM104 | 3 | Ir | — | 0 |
| BD105 | LM105 | 3 | Ir | — | 0 |
| BD106 | LM106 | 3 | Ir | — | 0 |
| BD107 | LM107 | 3 | Ir | — | 0 |
| BD108 | LM108 | 3 | Ir | — | 0 |
| BD109 | LM109 | 3 | Ir | — | 0 |
| BD110 | LM110 | 3 | Ir | — | 0 |
| BD111 | LM111 | 3 | Ir | — | 0 |
| BD112 | LM112 | 3 | Ir | — | 0 |
| BD113 | LM113 | 3 | Ir | — | 0 |
| BD114 | LM114 | 3 | Ir | — | 0 |
| BD115 | LM115 | 3 | Ir | — | 0 |
| BD116 | LM116 | 3 | Ir | — | 0 |

TABLE 3-continued

| Compound name | $L_{101}$ | n101 | $M_{101}$ | $L_{102}$ | m101 |
|---|---|---|---|---|---|
| BD117 | LM117 | 3 | Ir | — | 0 |
| BD118 | LM118 | 3 | Ir | — | 0 |
| BD119 | LM119 | 3 | Ir | — | 0 |
| BD120 | LM120 | 3 | Ir | — | 0 |
| BD121 | LM121 | 3 | Ir | — | 0 |
| BD122 | LM122 | 3 | Ir | — | 0 |
| BD123 | LM123 | 3 | Ir | — | 0 |
| BD124 | LM124 | 3 | Ir | — | 0 |
| BD125 | LM125 | 3 | Ir | — | 0 |
| BD126 | LM126 | 3 | Ir | — | 0 |
| BD127 | LM127 | 3 | Ir | — | 0 |
| BD128 | LM128 | 3 | Ir | — | 0 |
| BD129 | LM129 | 3 | Ir | — | 0 |
| BD130 | LM130 | 3 | Ir | — | 0 |
| BD131 | LM131 | 3 | Ir | — | 0 |
| BD132 | LM132 | 3 | Ir | — | 0 |
| BD133 | LM133 | 3 | Ir | — | 0 |
| BD134 | LM134 | 3 | Ir | — | 0 |
| BD135 | LM135 | 3 | Ir | — | 0 |
| BD136 | LM136 | 3 | Ir | — | 0 |
| BD137 | LM137 | 3 | Ir | — | 0 |
| BD138 | LM138 | 3 | Ir | — | 0 |
| BD139 | LM139 | 3 | Ir | — | 0 |
| BD140 | LM140 | 3 | Ir | — | 0 |
| BD141 | LM141 | 3 | Ir | — | 0 |
| BD142 | LM142 | 3 | Ir | — | 0 |
| BD143 | LM143 | 3 | Ir | — | 0 |
| BD144 | LM144 | 3 | Ir | — | 0 |
| BD145 | LM145 | 3 | Ir | — | 0 |
| BD146 | LM146 | 3 | Ir | — | 0 |
| BD147 | LM147 | 3 | Ir | — | 0 |
| BD148 | LM148 | 3 | Ir | — | 0 |
| BD149 | LM149 | 3 | Ir | — | 0 |
| BD150 | LM150 | 3 | Ir | — | 0 |
| BD151 | LM151 | 3 | Ir | — | 0 |
| BD152 | LM152 | 3 | Ir | — | 0 |
| BD153 | LM153 | 3 | Ir | — | 0 |
| BD154 | LM154 | 3 | Ir | — | 0 |
| BD155 | LM155 | 3 | Ir | — | 0 |
| BD156 | LM156 | 3 | Ir | — | 0 |
| BD157 | LM157 | 3 | Ir | — | 0 |
| BD158 | LM158 | 3 | Ir | — | 0 |
| BD159 | LM159 | 3 | Ir | — | 0 |
| BD160 | LM160 | 3 | Ir | — | 0 |
| BD161 | LM161 | 3 | Ir | — | 0 |
| BD162 | LM162 | 3 | Ir | — | 0 |
| BD163 | LM163 | 3 | Ir | — | 0 |
| BD164 | LM164 | 3 | Ir | — | 0 |
| BD165 | LM165 | 3 | Ir | — | 0 |
| BD166 | LM166 | 3 | Ir | — | 0 |
| BD167 | LM167 | 3 | Ir | — | 0 |
| BD168 | LM168 | 3 | Ir | — | 0 |
| BD169 | LM169 | 3 | Ir | — | 0 |
| BD170 | LM170 | 3 | Ir | — | 0 |
| BD171 | LM171 | 3 | Ir | — | 0 |
| BD172 | LM172 | 3 | Ir | — | 0 |
| BD173 | LM173 | 3 | Ir | — | 0 |
| BD174 | LM174 | 3 | Ir | — | 0 |
| BD175 | LM175 | 3 | Ir | — | 0 |
| BD176 | LM176 | 3 | Ir | — | 0 |
| BD177 | LM177 | 3 | Ir | — | 0 |
| BD178 | LM178 | 3 | Ir | — | 0 |
| BD179 | LM179 | 3 | Ir | — | 0 |
| BD180 | LM180 | 3 | Ir | — | 0 |
| BD181 | LM181 | 3 | Ir | — | 0 |
| BD182 | LM182 | 3 | Ir | — | 0 |
| BD183 | LM183 | 3 | Ir | — | 0 |
| BD184 | LM184 | 3 | Ir | — | 0 |
| BD185 | LM185 | 3 | Ir | — | 0 |
| BD186 | LM186 | 3 | Ir | — | 0 |
| BD187 | LM187 | 3 | Ir | — | 0 |
| BD188 | LM188 | 3 | Ir | — | 0 |
| BD189 | LM189 | 3 | Ir | — | 0 |
| BD190 | LM190 | 3 | Ir | — | 0 |
| BD191 | LM191 | 3 | Ir | — | 0 |
| BD192 | LM192 | 3 | Ir | — | 0 |
| BD193 | LM193 | 3 | Ir | — | 0 |

TABLE 3-continued

| Compound name | $L_{101}$ | n101 | $M_{101}$ | $L_{102}$ | m101 |
|---|---|---|---|---|---|
| BD194 | LM194 | 3 | Ir | — | 0 |
| BD195 | LM195 | 3 | Ir | — | 0 |
| BD196 | LM196 | 3 | Ir | — | 0 |
| BD197 | LM197 | 3 | Ir | — | 0 |
| BD198 | LM198 | 3 | Ir | — | 0 |
| BD199 | LM199 | 3 | Ir | — | 0 |
| BD200 | LM200 | 3 | Ir | — | 0 |

TABLE 4

| Compound name | $L_{101}$ | n101 | $M_{101}$ | $L_{102}$ | m101 |
|---|---|---|---|---|---|
| BD201 | LM201 | 3 | Ir | — | 0 |
| BD202 | LM202 | 3 | Ir | — | 0 |
| BD203 | LM203 | 3 | Ir | — | 0 |
| BD204 | LM204 | 3 | Ir | — | 0 |
| BD205 | LM205 | 3 | Ir | — | 0 |
| BD206 | LM206 | 3 | Ir | — | 0 |
| BD207 | LM207 | 3 | Ir | — | 0 |
| BD208 | LM208 | 3 | Ir | — | 0 |
| BD209 | LM209 | 3 | Ir | — | 0 |
| BD210 | LM210 | 3 | Ir | — | 0 |
| BD211 | LM211 | 3 | Ir | — | 0 |
| BD212 | LM212 | 3 | Ir | — | 0 |
| BD213 | LM213 | 3 | Ir | — | 0 |
| BD214 | LM214 | 3 | Ir | — | 0 |
| BD215 | LM215 | 3 | Ir | — | 0 |
| BD216 | LM216 | 3 | Ir | — | 0 |
| BD217 | LM217 | 3 | Ir | — | 0 |
| BD218 | LM218 | 3 | Ir | — | 0 |
| BD219 | LM219 | 3 | Ir | — | 0 |
| BD220 | LM220 | 3 | Ir | — | 0 |
| BD221 | LM221 | 3 | Ir | — | 0 |
| BD222 | LM222 | 3 | Ir | — | 0 |
| BD223 | LM223 | 3 | Ir | — | 0 |
| BD224 | LM224 | 3 | Ir | — | 0 |
| BD225 | LM225 | 3 | Ir | — | 0 |
| BD226 | LM226 | 3 | Ir | — | 0 |
| BD227 | LM227 | 3 | Ir | — | 0 |
| BD228 | LM228 | 3 | Ir | — | 0 |
| BD229 | LM229 | 3 | Ir | — | 0 |
| BD230 | LM230 | 3 | Ir | — | 0 |
| BD231 | LM231 | 3 | Ir | — | 0 |
| BD232 | LM232 | 3 | Ir | — | 0 |
| BD233 | LM233 | 3 | Ir | — | 0 |
| BD234 | LM234 | 3 | Ir | — | 0 |
| BD235 | LM235 | 3 | Ir | — | 0 |
| BD236 | LM236 | 3 | Ir | — | 0 |
| BD237 | LM237 | 3 | Ir | — | 0 |
| BD238 | LM238 | 3 | Ir | — | 0 |
| BD239 | LM239 | 3 | Ir | — | 0 |
| BD240 | LM240 | 3 | Ir | — | 0 |
| BD241 | LM241 | 3 | Ir | — | 0 |
| BD242 | LM242 | 3 | Ir | — | 0 |
| BD243 | LM243 | 3 | Ir | — | 0 |
| BD244 | LFM1 | 3 | Ir | — | 0 |
| BD245 | LFM2 | 3 | Ir | — | 0 |
| BD246 | LFM3 | 3 | Ir | — | 0 |
| BD247 | LFM4 | 3 | Ir | — | 0 |
| BD248 | LFM5 | 3 | Ir | — | 0 |
| BD249 | LFM6 | 3 | Ir | — | 0 |
| BD250 | LFM7 | 3 | Ir | — | 0 |
| BD251 | LFP1 | 3 | Ir | — | 0 |
| BD252 | LFP2 | 3 | Ir | — | 0 |
| BD253 | LFP3 | 3 | Ir | — | 0 |
| BD254 | LFP4 | 3 | Ir | — | 0 |
| BD255 | LFP5 | 3 | Ir | — | 0 |
| BD256 | LFP6 | 3 | Ir | — | 0 |
| BD257 | LFP7 | 3 | Ir | — | 0 |
| BD258 | LM47 | 2 | Ir | AN1 | 1 |
| BD259 | LM47 | 2 | Ir | AN2 | 1 |
| BD260 | LM47 | 2 | Ir | AN3 | 1 |
| BD261 | LM47 | 2 | Ir | AN4 | 1 |

TABLE 4-continued

| Compound name | $L_{101}$ | n101 | $M_{101}$ | $L_{102}$ | m101 |
|---|---|---|---|---|---|
| BD262 | LM47 | 2 | Ir | AN5 | 1 |
| BD263 | LM11 | 2 | Pt | — | 0 |
| BD264 | LM13 | 2 | Pt | — | 0 |
| BD265 | LM15 | 2 | Pt | — | 0 |
| BD266 | LM45 | 2 | Pt | — | 0 |
| BD267 | LM47 | 2 | Pt | — | 0 |
| BD268 | LM49 | 2 | Pt | — | 0 |
| BD269 | LM98 | 2 | Pt | — | 0 |
| BD270 | LM100 | 2 | Pt | — | 0 |
| BD271 | LM102 | 2 | Pt | — | 0 |
| BD272 | LM132 | 2 | Pt | — | 0 |
| BD273 | LM134 | 2 | Pt | — | 0 |
| BD274 | LM136 | 2 | Pt | — | 0 |
| BD275 | LM151 | 2 | Pt | — | 0 |
| BD276 | LM153 | 2 | Pt | — | 0 |
| BD277 | LM158 | 2 | Pt | — | 0 |
| BD278 | LM180 | 2 | Pt | — | 0 |
| BD279 | LM182 | 2 | Pt | — | 0 |
| BD280 | LM187 | 2 | Pt | — | 0 |
| BD281 | LM201 | 2 | Pt | — | 0 |
| BD282 | LM206 | 2 | Pt | — | 0 |
| BD283 | LM211 | 2 | Pt | — | 0 |
| BD284 | LM233 | 2 | Pt | — | 0 |
| BD285 | LM235 | 2 | Pt | — | 0 |
| BD286 | LM240 | 2 | Pt | — | 0 |
| BD287 | LFM5 | 2 | Pt | — | 0 |
| BD288 | LFM6 | 2 | Pt | — | 0 |
| BD289 | LFM7 | 2 | Pt | — | 0 |
| BD290 | LFP5 | 2 | Pt | — | 0 |
| BD291 | LFP6 | 2 | Pt | — | 0 |
| BD292 | LFP7 | 2 | Pt | — | 0 |
| BD293 | LM47 | 1 | Pt | AN1 | 1 |
| BD294 | LM47 | 1 | Pt | AN2 | 1 |
| BD295 | LM47 | 1 | Pt | AN3 | 1 |
| BD296 | LM47 | 1 | Pt | AN4 | 1 |
| BD297 | LM47 | 1 | Pt | AN5 | 1 |

Referring to Tables 2 to 4, LM1 to LM243 may respectively be understood by referring to Formulae 1-1 to 1-3 and Tables 5 to 7:

1-1

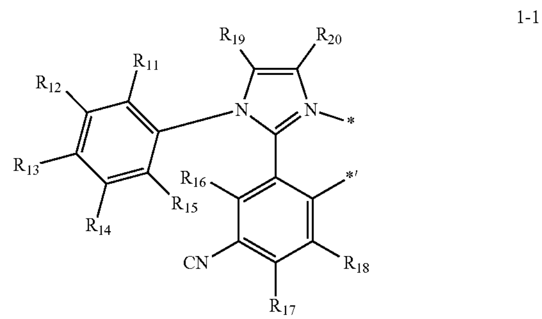

1-2

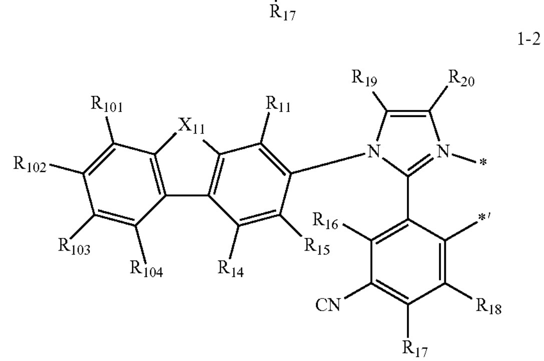

-continued 1-3

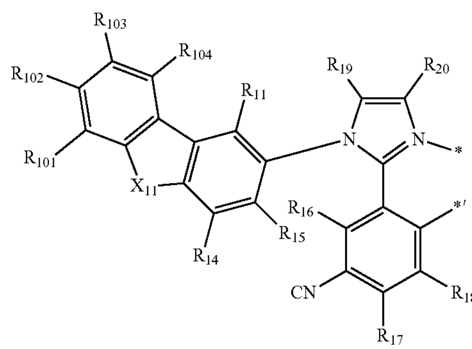

TABLE 5

| Formula 1-1 | | | | | | | | | | |
|---|---|---|---|---|---|---|---|---|---|---|
| Ligand | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
| LM1 | X1 | H | X3 | H | X1 | H | H | H | H | D |
| LM2 | X1 | H | X3 | H | X1 | H | H | H | D | H |
| LM3 | X1 | H | X3 | H | X1 | H | H | H | D | D |
| LM4 | Y1 | H | X3 | H | Y1 | H | H | H | D | D |
| LM5 | Y2 | H | X3 | H | Y2 | H | H | H | D | D |
| LM6 | Y3 | H | X3 | H | Y3 | H | H | H | D | D |
| LM7 | Y3 | D | X3 | D | Y3 | H | H | H | D | D |
| LM8 | Y3 | D | X3 | D | Y3 | D | H | H | D | D |
| LM9 | Y3 | D | X3 | D | Y3 | D | D | H | D | D |
| LM10 | Y3 | D | X3 | D | Y3 | D | D | D | D | D |
| LM11 | Y3 | D | Y11 | D | Y3 | D | D | D | D | D |
| LM12 | Y3 | D | Y11 | D | Y3 | H | X1 | H | D | D |
| LM13 | Y3 | D | Y11 | D | Y3 | D | Y3 | D | D | D |
| LM14 | Y3 | D | Y11 | D | Y3 | H | X4 | H | D | D |
| LM15 | Y3 | D | Y11 | D | Y3 | D | Y12 | D | D | D |
| LM16 | X2 | H | X3 | H | X2 | H | H | H | H | D |
| LM17 | X2 | H | X3 | H | X2 | H | H | H | D | H |
| LM18 | X2 | H | X3 | H | X2 | H | H | H | D | D |
| LM19 | Y4 | H | X3 | H | Y4 | H | H | H | D | D |
| LM20 | Y5 | H | X3 | H | Y5 | H | H | H | D | D |
| LM21 | Y6 | H | X3 | H | Y6 | H | H | H | D | D |
| LM22 | Y7 | H | X3 | H | Y7 | H | H | H | D | D |
| LM23 | Y8 | H | X3 | H | Y8 | H | H | H | D | D |
| LM24 | Y9 | H | X3 | H | Y9 | H | H | H | D | D |
| LM25 | Y10 | H | X3 | H | Y10 | H | H | H | D | D |
| LM26 | Y10 | D | X3 | D | Y10 | H | H | H | D | D |
| LM27 | Y10 | D | X3 | D | Y10 | D | H | H | D | D |
| LM28 | Y10 | D | X3 | D | Y10 | D | D | H | D | D |
| LM29 | Y10 | D | X3 | D | Y10 | D | D | D | D | D |
| LM30 | Y10 | D | Y11 | D | Y10 | D | D | D | D | D |
| LM31 | Y10 | D | Y11 | D | Y10 | H | X1 | H | D | D |
| LM32 | Y10 | D | Y11 | D | Y10 | D | Y3 | D | D | D |
| LM33 | Y10 | D | Y11 | D | Y10 | H | X4 | H | D | D |
| LM34 | Y10 | D | Y11 | D | Y10 | D | Y12 | D | D | D |
| LM35 | X1 | H | X4 | H | X1 | H | H | H | H | D |
| LM36 | X1 | H | X4 | H | X1 | H | H | H | D | H |
| LM37 | X1 | H | X4 | H | X1 | H | H | H | D | D |
| LM38 | Y1 | H | X4 | H | Y1 | H | H | H | D | D |
| LM39 | Y2 | H | X4 | H | Y2 | H | H | H | D | D |
| LM40 | Y3 | H | X4 | H | Y3 | H | H | H | D | D |
| LM41 | Y3 | D | X4 | D | Y3 | H | H | H | D | D |
| LM42 | Y3 | D | X4 | D | Y3 | D | H | H | D | D |
| LM43 | Y3 | D | X4 | D | Y3 | D | D | H | D | D |
| LM44 | Y3 | D | X4 | D | Y3 | D | D | D | D | D |
| LM45 | Y3 | D | Y12 | D | Y3 | D | D | D | D | D |
| LM46 | Y3 | D | Y12 | D | Y3 | H | X1 | H | D | D |
| LM47 | Y3 | D | Y12 | D | Y3 | D | Y3 | D | D | D |
| LM48 | Y3 | D | Y12 | D | Y3 | H | X4 | H | D | D |
| LM49 | Y3 | D | Y12 | D | Y3 | D | Y12 | D | D | D |
| LM50 | X2 | H | X4 | H | X2 | H | H | H | H | D |
| LM51 | X2 | H | X4 | H | X2 | H | H | H | D | H |
| LM52 | X2 | H | X4 | H | X2 | H | H | H | D | D |
| LM53 | Y4 | H | X4 | H | Y4 | H | H | H | D | D |
| LM54 | Y5 | H | X4 | H | Y5 | H | H | H | D | D |
| LM55 | Y6 | H | X4 | H | Y6 | H | H | H | D | D |
| LM56 | Y7 | H | X4 | H | Y7 | H | H | H | D | D |
| LM57 | Y8 | H | X4 | H | Y8 | H | H | H | D | D |
| LM58 | Y9 | H | X4 | H | Y9 | H | H | H | D | D |
| LM59 | Y10 | H | X4 | H | Y10 | H | H | H | D | D |
| LM60 | Y10 | D | X4 | D | Y10 | H | H | H | D | D |
| LM61 | Y10 | D | X4 | D | Y10 | D | H | H | D | D |
| LM62 | Y10 | D | X4 | D | Y10 | D | D | H | D | D |
| LM63 | Y10 | D | X4 | D | Y10 | D | D | D | D | D |
| LM64 | Y10 | D | Y12 | D | Y10 | D | D | D | D | D |
| LM65 | Y10 | D | Y12 | D | Y10 | H | X1 | H | D | D |
| LM66 | Y10 | D | Y12 | D | Y10 | D | Y3 | D | D | D |
| LM67 | Y10 | D | Y12 | D | Y10 | H | X4 | H | D | D |
| LM68 | Y10 | D | Y12 | D | Y10 | D | Y12 | D | D | D |
| LM69 | X1 | H | X5 | H | X1 | H | H | H | H | D |
| LM70 | X1 | H | X5 | H | X1 | H | H | H | D | H |
| LM71 | X1 | H | X5 | H | X1 | H | H | H | D | D |
| LM72 | Y1 | H | X5 | H | Y1 | H | H | H | D | D |
| LM73 | Y2 | H | X5 | H | Y2 | H | H | H | D | D |
| LM74 | Y3 | H | X5 | H | Y3 | H | H | H | D | D |
| LM75 | Y3 | D | X5 | D | Y3 | H | H | H | D | D |
| LM76 | Y3 | D | X5 | D | Y3 | D | H | H | D | D |
| LM77 | Y3 | D | X5 | D | Y3 | D | D | H | D | D |
| LM78 | Y3 | D | X5 | D | Y3 | D | D | D | D | D |
| LM79 | Y3 | D | Y13 | D | Y3 | D | D | D | D | D |
| LM80 | Y3 | D | Y13 | D | Y3 | H | X1 | H | D | D |
| LM81 | Y3 | D | Y13 | D | Y3 | D | Y3 | D | D | D |
| LM82 | Y3 | D | Y13 | D | Y3 | H | X4 | H | D | D |
| LM83 | Y3 | D | Y13 | D | Y3 | D | Y12 | D | D | D |
| LM84 | X2 | H | X5 | H | X2 | H | H | H | H | D |
| LM85 | X2 | H | X5 | H | X2 | H | H | H | D | H |
| LM86 | X2 | H | X5 | H | X2 | H | H | H | D | D |
| LM87 | Y4 | H | X5 | H | Y4 | H | H | H | D | D |
| LM88 | Y5 | H | X5 | H | Y5 | H | H | H | D | D |
| LM89 | Y6 | H | X5 | H | Y6 | H | H | H | D | D |
| LM90 | Y7 | H | X5 | H | Y7 | H | H | H | D | D |
| LM91 | Y8 | H | X5 | H | Y8 | H | H | H | D | D |
| LM92 | Y9 | H | X5 | H | Y9 | H | H | H | D | D |
| LM93 | Y10 | H | X5 | H | Y10 | H | H | H | D | D |
| LM94 | Y10 | D | X5 | D | Y10 | H | H | H | D | D |
| LM95 | Y10 | D | X5 | D | Y10 | D | H | H | D | D |
| LM96 | Y10 | D | X5 | D | Y10 | D | D | H | D | D |
| LM97 | Y10 | D | X5 | D | Y10 | D | D | D | D | D |
| LM98 | Y10 | D | Y13 | D | Y10 | D | D | D | D | D |
| LM99 | Y10 | D | Y13 | D | Y10 | H | X1 | H | D | D |
| LM100 | Y10 | D | Y13 | D | Y10 | D | Y3 | D | D | D |
| LM101 | Y10 | D | Y13 | D | Y10 | H | X4 | H | D | D |
| LM102 | Y10 | D | Y13 | D | Y10 | D | Y12 | D | D | D |
| LM103 | X1 | H | X6 | H | X1 | H | H | H | H | D |
| LM104 | X1 | H | X6 | H | X1 | H | H | H | D | H |
| LM105 | X1 | H | X6 | H | X1 | H | H | H | D | D |
| LM106 | Y1 | H | X6 | H | Y1 | H | H | H | D | D |
| LM107 | Y2 | H | X6 | H | Y2 | H | H | H | D | D |
| LM108 | Y3 | H | X6 | H | Y3 | H | H | H | D | D |
| LM109 | Y3 | D | X6 | D | Y3 | H | H | H | D | D |
| LM110 | Y3 | D | X6 | D | Y3 | D | H | H | D | D |
| LM111 | Y3 | D | X6 | D | Y3 | D | D | H | D | D |
| LM112 | Y3 | D | X6 | D | Y3 | D | D | D | D | D |
| LM113 | Y3 | D | Y14 | D | Y3 | D | D | D | D | D |
| LM114 | Y3 | D | Y14 | D | Y3 | H | X1 | H | D | D |
| LM115 | Y3 | D | Y14 | D | Y3 | D | Y3 | D | D | D |
| LM116 | Y3 | D | Y14 | D | Y3 | H | X4 | H | D | D |
| LM117 | Y3 | D | Y14 | D | Y3 | D | Y12 | D | D | D |
| LM118 | X2 | H | X6 | H | X2 | H | H | H | H | D |
| LM119 | X2 | H | X6 | H | X2 | H | H | H | D | H |
| LM120 | X2 | H | X6 | H | X2 | H | H | H | D | D |
| LM121 | Y4 | H | X6 | H | Y4 | H | H | H | D | D |
| LM122 | Y5 | H | X6 | H | Y5 | H | H | H | D | D |
| LM123 | Y6 | H | X6 | H | Y6 | H | H | H | D | D |
| LM124 | Y7 | H | X6 | H | Y7 | H | H | H | D | D |
| LM125 | Y8 | H | X6 | H | Y8 | H | H | H | D | D |
| LM126 | Y9 | H | X6 | H | Y9 | H | H | H | D | D |
| LM127 | Y10 | H | X6 | H | Y10 | H | H | H | D | D |
| LM128 | Y10 | D | X6 | D | Y10 | H | H | H | D | D |
| LM129 | Y10 | D | X6 | D | Y10 | D | H | H | D | D |
| LM130 | Y10 | D | X6 | D | Y10 | D | D | H | D | D |

TABLE 5-continued

Formula 1-1

| Ligand | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
|---|---|---|---|---|---|---|---|---|---|---|
| LM131 | Y10 | D | X6 | D | Y10 | D | D | D | D | D |
| LM132 | Y10 | D | Y14 | D | Y10 | D | D | D | D | D |
| LM133 | Y10 | D | Y14 | D | Y10 | H | X1 | H | D | D |
| LM134 | Y10 | D | Y14 | D | Y10 | D | Y3 | D | D | D |
| LM135 | Y10 | D | Y14 | D | Y10 | H | X4 | H | D | D |
| LM136 | Y10 | D | Y14 | D | Y10 | D | Y12 | D | D | D |
| LM137 | X1 | H | X7 | H | X1 | H | H | H | H | D |
| LM138 | X1 | H | X7 | H | X1 | H | H | H | D | H |
| LM139 | X1 | H | X7 | H | X1 | H | H | H | D | D |
| LM140 | Y1 | H | X7 | H | Y1 | H | H | H | D | D |
| LM141 | Y2 | H | X7 | H | Y2 | H | H | H | D | D |
| LM142 | Y3 | H | X7 | H | Y3 | H | H | H | D | D |
| LM143 | Y3 | D | X7 | D | Y3 | H | H | H | D | D |
| LM144 | Y3 | D | X7 | D | Y3 | D | H | H | D | D |
| LM145 | Y3 | D | X7 | D | Y3 | D | D | H | D | D |
| LM146 | Y3 | D | X7 | D | Y3 | D | D | D | D | D |
| LM147 | Y3 | D | X8 | D | Y3 | D | D | D | D | D |
| LM148 | Y3 | D | Y16 | D | Y3 | D | D | D | D | D |
| LM149 | Y3 | D | Y17 | D | Y3 | D | D | D | D | D |
| LM150 | Y3 | D | Y18 | D | Y3 | D | D | D | D | D |
| LM151 | Y3 | D | Y15 | D | Y3 | D | D | D | D | D |
| LM152 | Y3 | D | Y15 | D | Y3 | H | X1 | H | D | D |
| LM153 | Y3 | D | Y15 | D | Y3 | D | Y3 | D | D | D |
| LM154 | Y3 | D | Y16 | D | Y3 | D | Y3 | D | D | D |
| LM155 | Y3 | D | Y17 | D | Y3 | D | Y3 | D | D | D |
| LM156 | Y3 | D | Y18 | D | Y3 | D | Y3 | D | D | D |
| LM157 | Y3 | D | Y15 | D | Y3 | H | X4 | H | D | D |
| LM158 | Y3 | D | Y15 | D | Y3 | D | Y12 | D | D | D |
| LM159 | Y3 | D | Y16 | D | Y3 | D | Y12 | D | D | D |
| LM160 | Y3 | D | Y17 | D | Y3 | D | Y12 | D | D | D |
| LM161 | Y3 | D | Y18 | D | Y3 | D | Y12 | D | D | D |
| LM162 | X2 | H | X7 | H | X2 | H | H | H | H | D |
| LM163 | X2 | H | X7 | H | X2 | H | H | H | D | H |
| LM164 | X2 | H | X7 | H | X2 | H | H | H | D | D |
| LM165 | Y4 | H | X7 | H | Y4 | H | H | H | D | D |
| LM166 | Y5 | H | X7 | H | Y5 | H | H | H | D | D |
| LM167 | Y6 | H | X7 | H | Y6 | H | H | H | D | D |
| LM168 | Y7 | H | X7 | H | Y7 | H | H | H | D | D |
| LM169 | Y8 | H | X7 | H | Y8 | H | H | H | D | D |
| LM170 | Y9 | H | X7 | H | Y9 | H | H | H | D | D |
| LM171 | Y10 | H | X7 | H | Y10 | H | H | H | D | D |
| LM172 | Y10 | D | X7 | D | Y10 | H | H | H | D | D |
| LM173 | Y10 | D | X7 | D | Y10 | D | H | H | D | D |
| LM174 | Y10 | D | X7 | D | Y10 | D | D | H | D | D |
| LM175 | Y10 | D | X7 | D | Y10 | D | D | D | D | D |
| LM176 | Y10 | D | X8 | D | Y10 | D | D | D | D | D |
| LM177 | Y10 | D | Y16 | D | Y10 | D | D | D | D | D |
| LM178 | Y10 | D | Y17 | D | Y10 | D | D | D | D | D |
| LM179 | Y10 | D | Y18 | D | Y10 | D | D | D | D | D |
| LM180 | Y10 | D | Y15 | D | Y10 | D | D | D | D | D |
| LM181 | Y10 | D | Y15 | D | Y10 | H | X1 | H | D | D |
| LM182 | Y10 | D | Y15 | D | Y10 | D | Y3 | D | D | D |
| LM183 | Y10 | D | Y16 | D | Y10 | D | Y3 | D | D | D |
| LM184 | Y10 | D | Y17 | D | Y10 | D | Y3 | D | D | D |
| LM185 | Y10 | D | Y18 | D | Y10 | D | Y3 | D | D | D |
| LM186 | Y10 | D | Y15 | D | Y10 | H | X4 | H | D | D |
| LM187 | Y10 | D | Y15 | D | Y10 | D | Y12 | D | D | D |
| LM188 | Y10 | D | Y16 | D | Y10 | D | Y12 | D | D | D |
| LM189 | Y10 | D | Y17 | D | Y10 | D | Y12 | D | D | D |
| LM190 | Y10 | D | Y18 | D | Y10 | D | Y12 | D | D | D |
| LM191 | X1 | X7 | H | H | X1 | H | H | H | H | D |
| LM192 | X1 | X7 | H | H | X1 | H | H | H | D | H |
| LM193 | X1 | X7 | H | H | X1 | H | H | H | D | D |
| LM194 | Y1 | X7 | H | H | Y1 | H | H | H | D | D |
| LM195 | Y2 | X7 | H | H | Y2 | H | H | H | D | D |
| LM196 | Y3 | X7 | H | H | Y3 | H | H | H | D | D |

TABLE 5-continued

Formula 1-1

| Ligand | $R_{11}$ | $R_{12}$ | $R_{13}$ | $R_{14}$ | $R_{15}$ | $R_{16}$ | $R_{17}$ | $R_{18}$ | $R_{19}$ | $R_{20}$ |
|---|---|---|---|---|---|---|---|---|---|---|
| LM197 | Y3 | X7 | D | D | Y3 | H | H | H | D | D |
| LM198 | Y3 | X7 | D | D | Y3 | D | H | H | D | D |
| LM199 | Y3 | X7 | D | D | Y3 | D | D | H | D | D |
| LM200 | Y3 | X7 | D | D | Y3 | D | D | D | D | D |
| LM201 | Y3 | Y15 | D | D | Y3 | D | D | D | D | D |
| LM202 | Y3 | Y16 | D | D | Y3 | D | D | D | D | D |
| LM203 | Y3 | Y17 | D | D | Y3 | D | D | D | D | D |
| LM204 | Y3 | Y18 | D | D | Y3 | D | D | D | D | D |
| LM205 | Y3 | Y15 | D | D | Y3 | H | X1 | H | D | D |
| LM206 | Y3 | Y15 | D | D | Y3 | D | Y3 | D | D | D |
| LM207 | Y3 | Y16 | D | D | Y3 | D | Y3 | D | D | D |
| LM208 | Y3 | Y17 | D | D | Y3 | D | Y3 | D | D | D |
| LM209 | Y3 | Y18 | D | D | Y3 | D | Y3 | D | D | D |
| LM210 | Y3 | Y15 | D | D | Y3 | H | X4 | H | D | D |
| LM211 | Y3 | Y15 | D | D | Y3 | D | Y12 | D | D | D |
| LM212 | Y3 | Y16 | D | D | Y3 | D | Y12 | D | D | D |
| LM213 | Y3 | Y17 | D | D | Y3 | D | Y12 | D | D | D |
| LM214 | Y3 | Y18 | D | D | Y3 | D | Y12 | D | D | D |
| LM215 | X2 | X7 | H | H | X2 | H | H | H | H | D |
| LM216 | X2 | X7 | H | H | X2 | H | H | H | D | H |
| LM217 | X2 | X7 | H | H | X2 | H | H | H | D | D |
| LM218 | Y4 | X7 | H | H | Y4 | H | H | H | D | D |
| LM219 | Y5 | X7 | H | H | Y5 | H | H | H | D | D |
| LM220 | Y6 | X7 | H | H | Y6 | H | H | H | D | D |
| LM221 | Y7 | X7 | H | H | Y7 | H | H | H | D | D |
| LM222 | Y8 | X7 | H | H | Y8 | H | H | H | D | D |
| LM223 | Y9 | X7 | H | H | Y9 | H | H | H | D | D |
| LM224 | Y10 | X7 | H | H | Y10 | H | H | H | D | D |
| LM225 | Y10 | X7 | D | D | Y10 | H | H | H | D | D |
| LM226 | Y10 | X7 | D | D | Y10 | D | H | H | D | D |
| LM227 | Y10 | X7 | D | D | Y10 | D | D | H | D | D |
| LM228 | Y10 | X7 | D | D | Y10 | D | D | D | D | D |
| LM229 | Y10 | X8 | D | D | Y10 | D | D | D | D | D |
| LM230 | Y10 | Y16 | D | D | Y10 | D | D | D | D | D |
| LM231 | Y10 | Y17 | D | D | Y10 | D | D | D | D | D |
| LM232 | Y10 | Y18 | D | D | Y10 | D | D | D | D | D |
| LM233 | Y10 | Y15 | D | D | Y10 | D | D | D | D | D |
| LM234 | Y10 | Y15 | D | D | Y10 | H | X1 | H | D | D |
| LM235 | Y10 | Y15 | D | D | Y10 | D | Y3 | D | D | D |
| LM236 | Y10 | Y16 | D | D | Y10 | D | Y3 | D | D | D |
| LM237 | Y10 | Y17 | D | D | Y10 | D | Y3 | D | D | D |
| LM238 | Y10 | Y18 | D | D | Y10 | D | Y3 | D | D | D |
| LM239 | Y10 | Y15 | D | D | Y10 | H | X4 | H | D | D |
| LM240 | Y10 | Y15 | D | D | Y10 | D | Y12 | D | D | D |
| LM241 | Y10 | Y16 | D | D | Y10 | D | Y12 | D | D | D |
| LM242 | Y10 | Y17 | D | D | Y10 | D | Y12 | D | D | D |
| LM243 | Y10 | Y18 | D | D | Y10 | D | Y12 | D | D | D |

TABLE 6

| Formula 1-2 | | | | | | | | | | | | | |
|---|---|---|---|---|---|---|---|---|---|---|---|---|---|
| Ligand | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFM1 | Y10 | N-Ph | D | D | D | D | D | Y10 | D | D | D | D | D |
| LFM2 | Y10 | S | D | D | D | D | D | Y10 | D | D | D | D | D |
| LFM3 | Y10 | O | D | D | D | D | D | Y10 | D | D | D | D | D |
| LFM4 | Y3 | O | D | D | D | D | D | Y3 | D | D | D | D | D |
| LFM5 | Y10 | O | D | D | D | D | D | Y10 | D | D | D | D | D |
| LFM6 | Y10 | O | D | D | D | D | D | Y10 | D | Y3 | D | D | D |
| LFM7 | Y10 | O | D | D | D | D | D | Y10 | D | Y12 | D | D | D |

TABLE 7

| Formula 1-3 | | | | | | | | | | | | | |
|---|---|---|---|---|---|---|---|---|---|---|---|---|---|
| Ligand | $R_{11}$ | $X_{11}$ | $R_{101}$ | $R_{102}$ | $R_{103}$ | $R_{104}$ | $R_{14}$ | $R_{15}$ | $R_{16}$ | $R_{17}$ | $R_{18}$ | $R_{19}$ | $R_{20}$ |
| LFP1 | Y10 | N-Ph | D | D | D | D | D | Y10 | D | D | D | D | D |
| LFP2 | Y10 | S | D | D | D | D | D | Y10 | D | D | D | D | D |
| LFP3 | Y10 | O | D | D | D | D | D | Y10 | D | D | D | D | D |
| LFP4 | Y3 | O | D | D | D | D | D | Y3 | D | D | D | D | D |
| LFP5 | Y10 | O | D | D | D | D | D | Y10 | D | D | D | D | D |
| LFP6 | Y10 | O | D | D | D | D | D | Y10 | D | Y3 | D | D | D |
| LFP7 | Y10 | O | D | D | D | D | D | Y10 | D | Y12 | D | D | D |

In Tables 5 to 7, X1 to X10 and Y1 to Y18 are the same as described below, and Ph represents a phenyl group:

X1

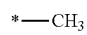

X2

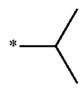

X3

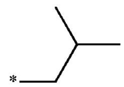

X4

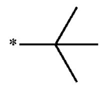

X5

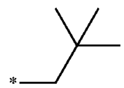

X6

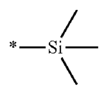

X7

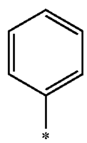

-continued

X8

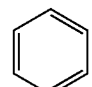

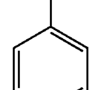

X9

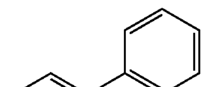

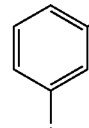

X10

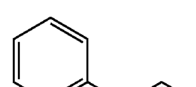

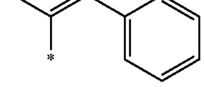

Y1

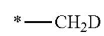

Y2

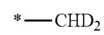

Y3

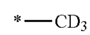

Y4

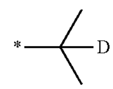

-continued
Y5
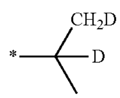
Y6
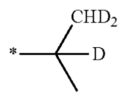
Y7
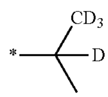
Y8
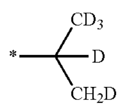
Y9
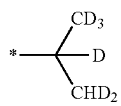
Y10
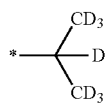
Y11
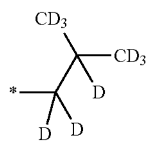
Y12
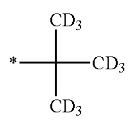
Y13
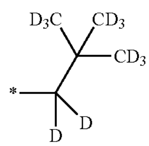
Y14
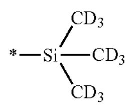
Y15
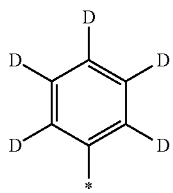
-continued
Y16
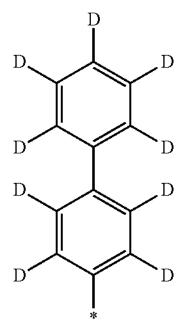
Y17
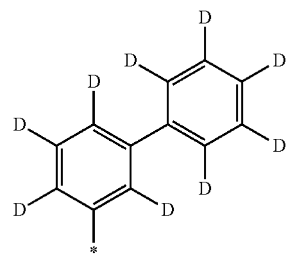
Y18
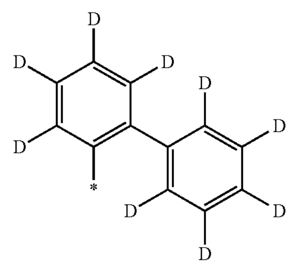
Y19
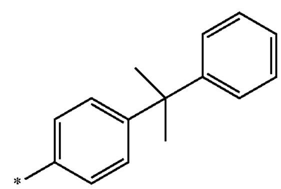
Y20
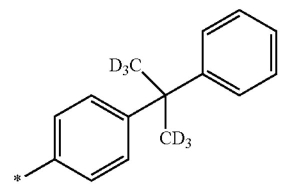
Y21
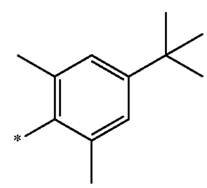

-continued
Y22
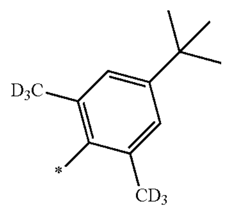
Group VI
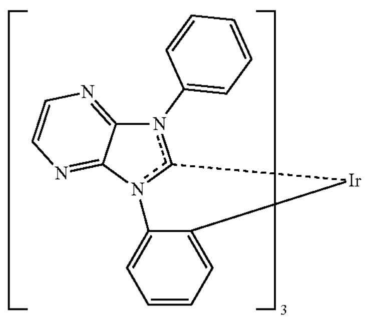
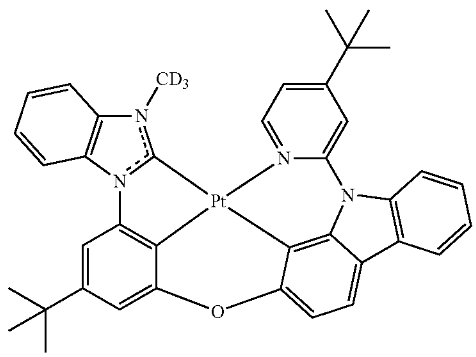
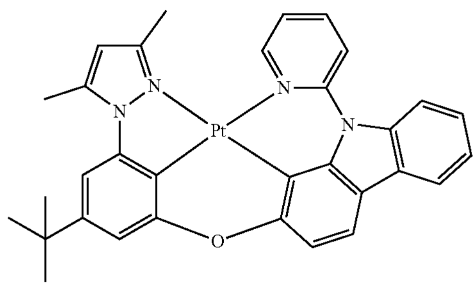
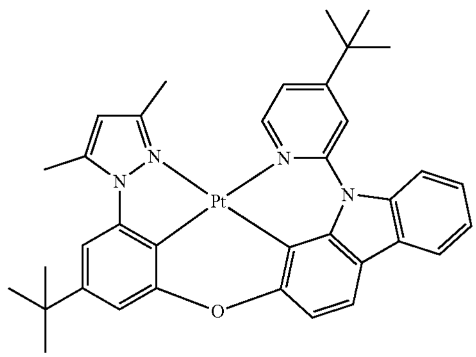
-continued
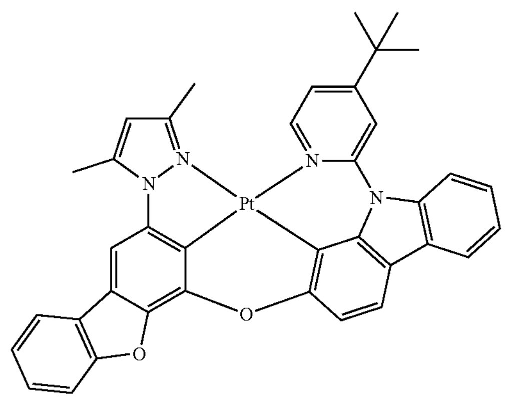
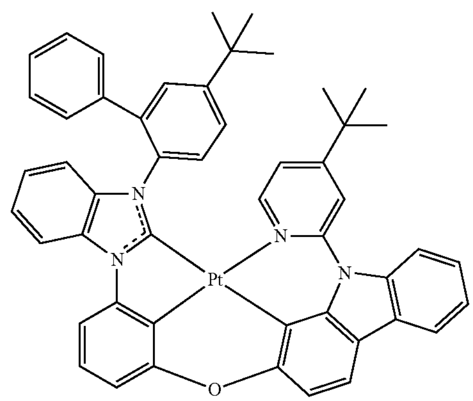
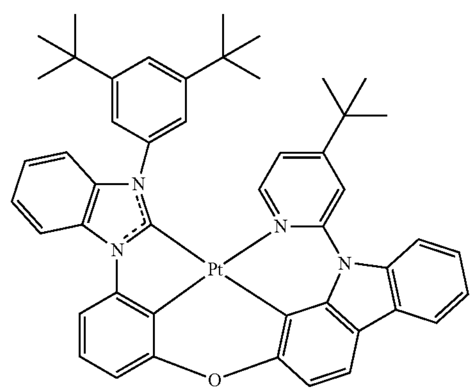
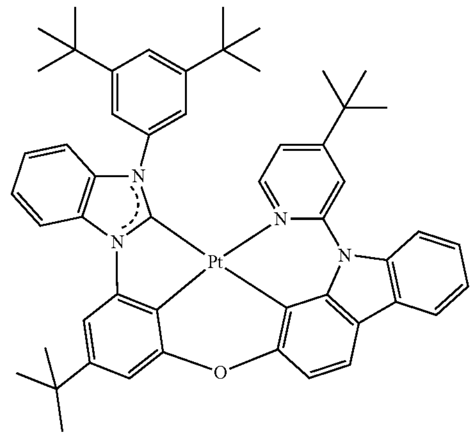

-continued
Group VII
1
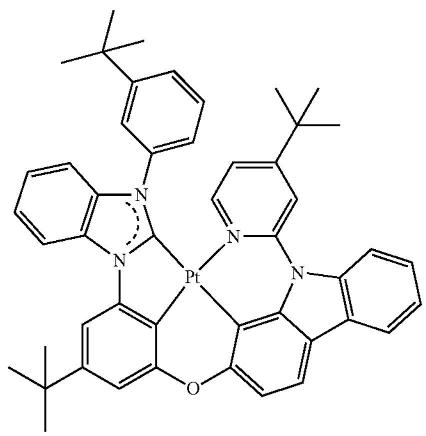
2
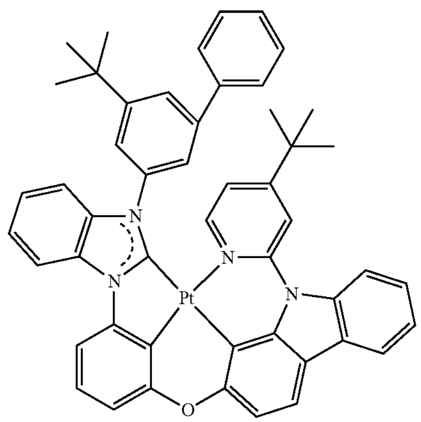
3
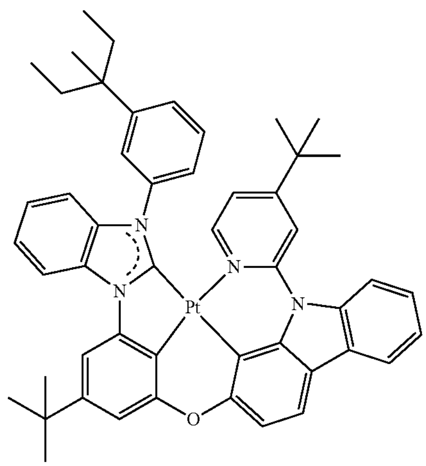
4
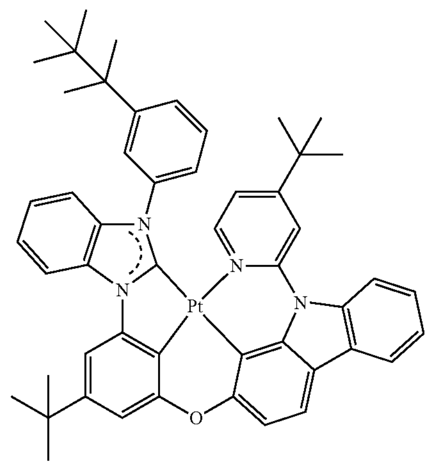
5
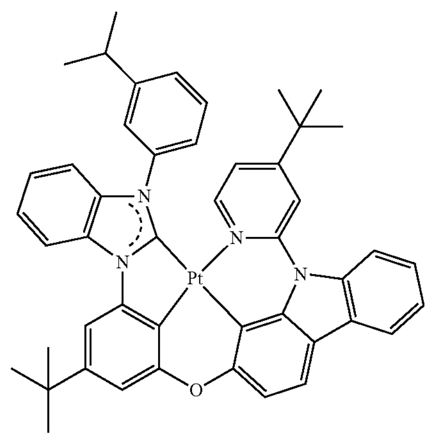
6
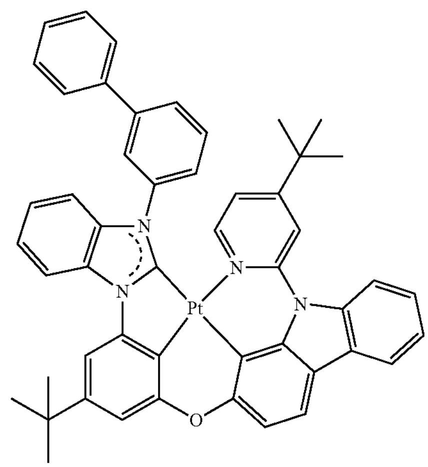

-continued
7
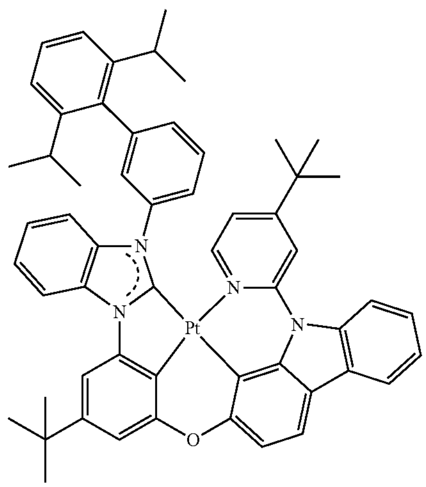
8
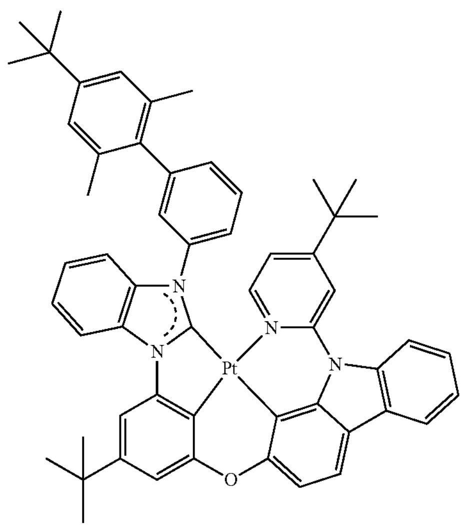
9
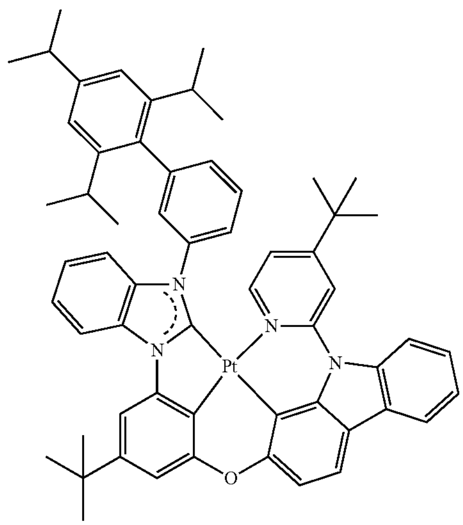
-continued
10
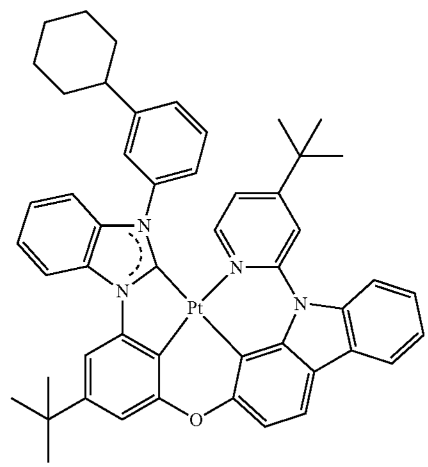
11
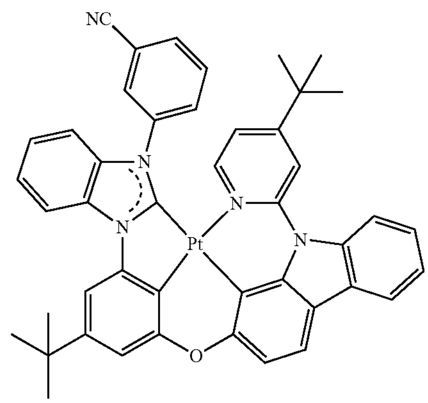
12
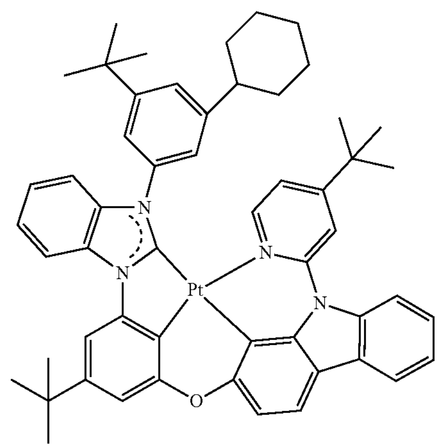

-continued
13
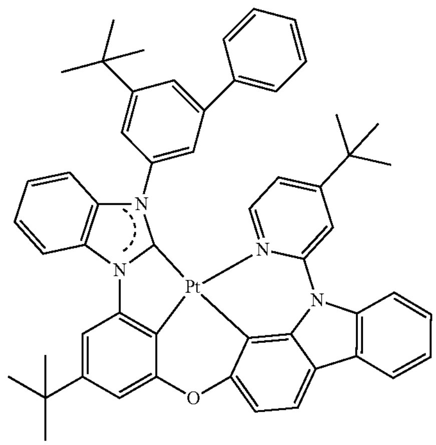
14
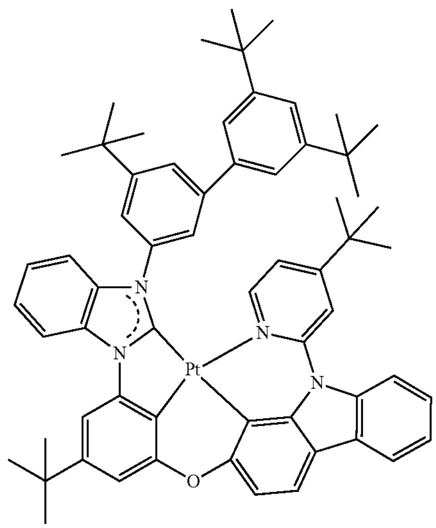
15
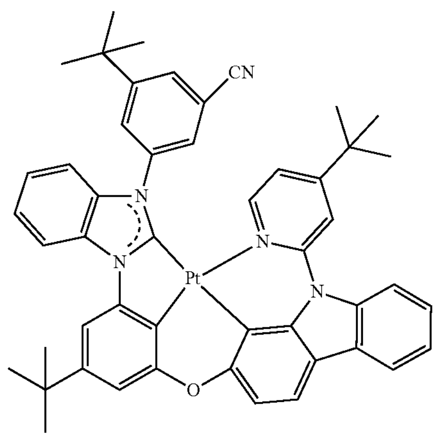
-continued
16
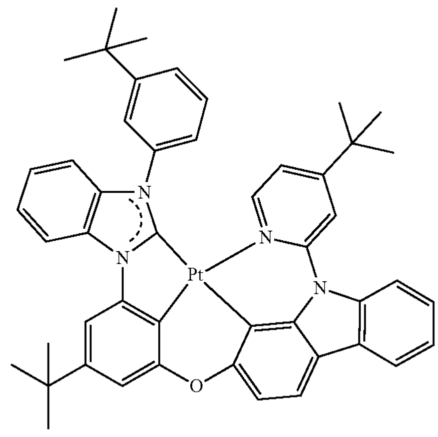
17
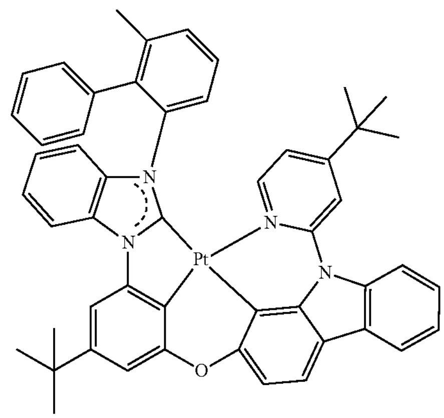
18
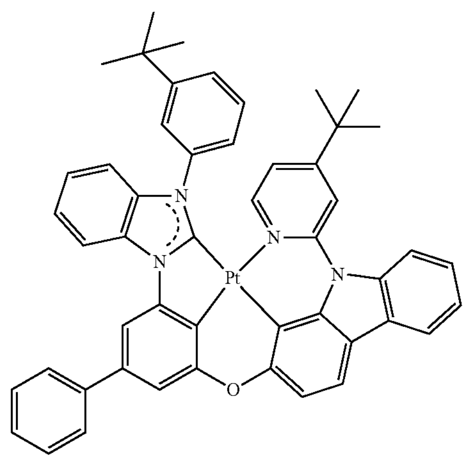

19
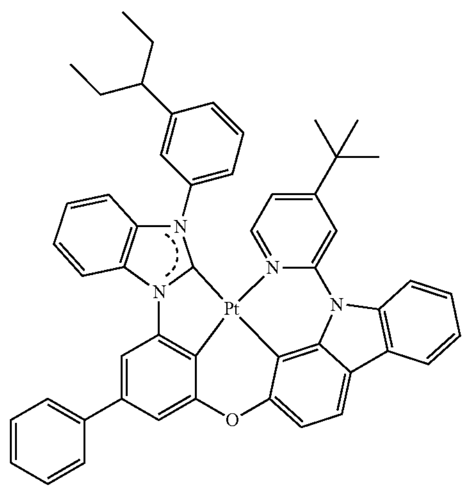
20
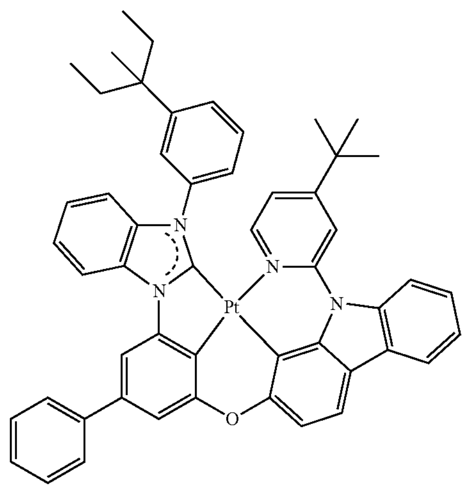
21
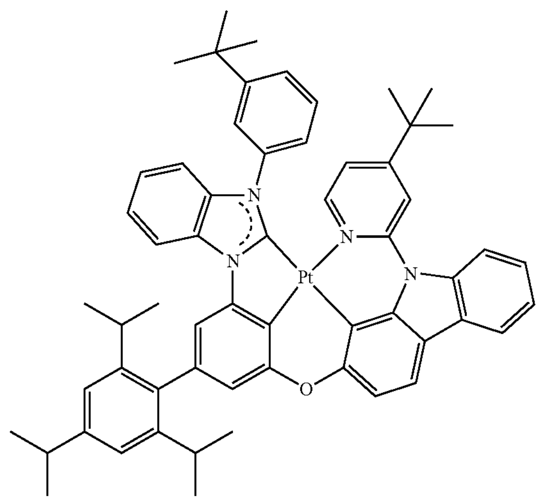
22
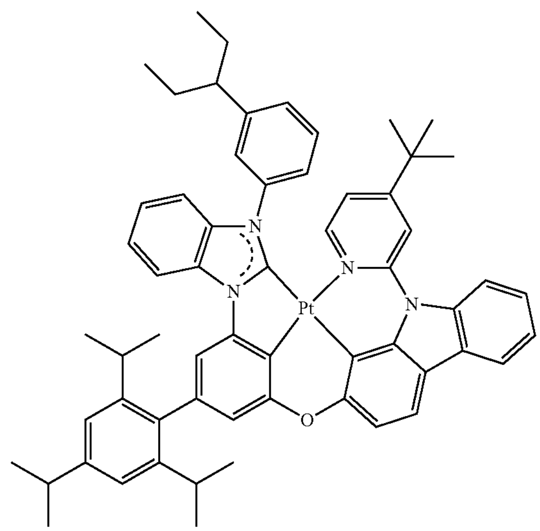
23
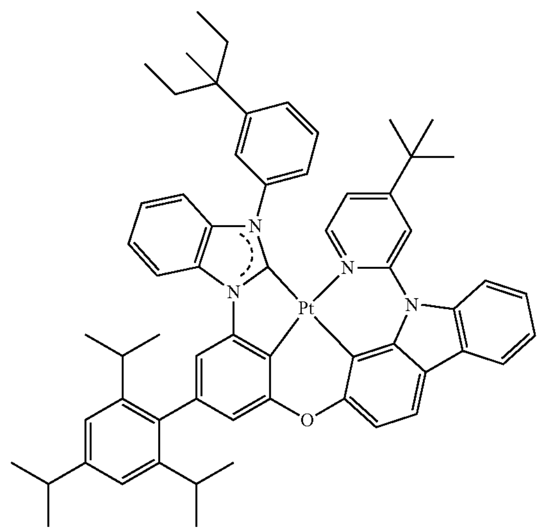
24
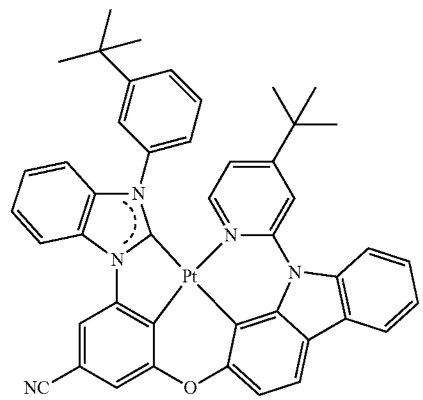

-continued
25
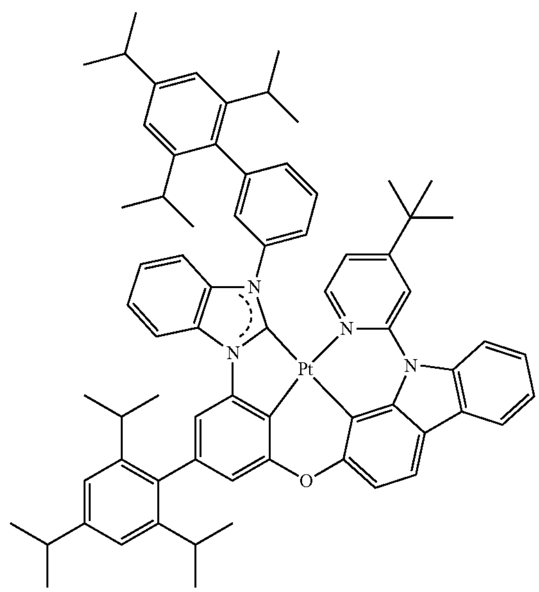
26
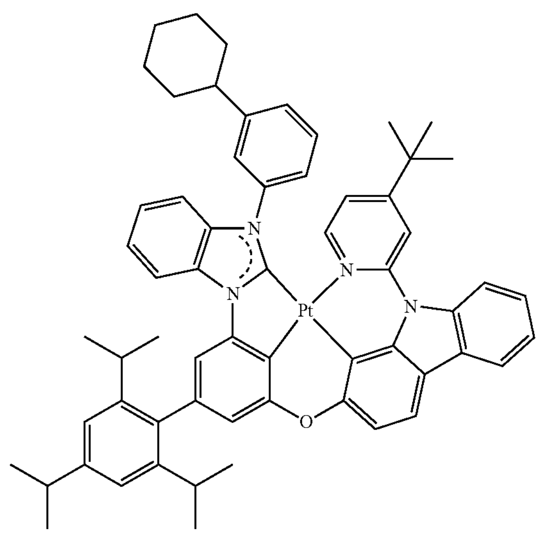
-continued
27
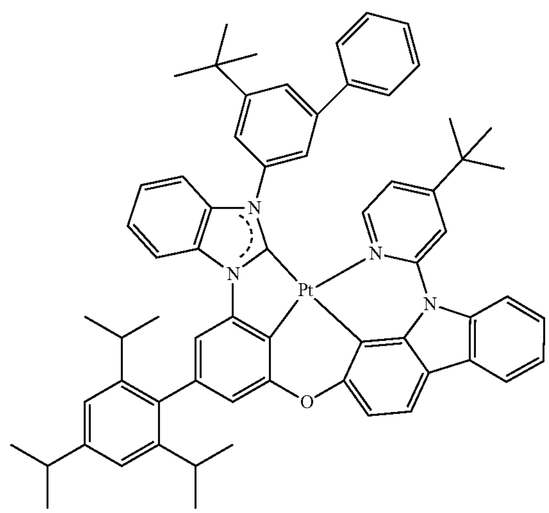
28
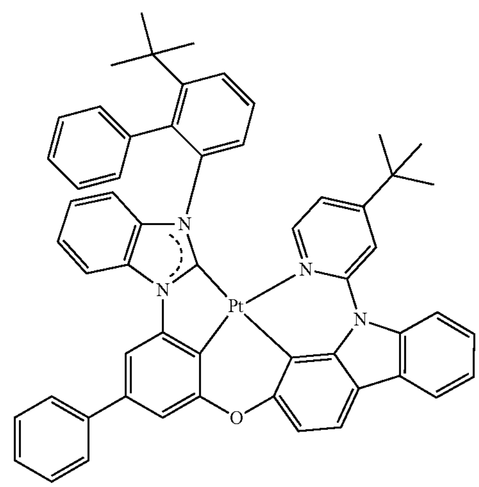
29

-continued
30
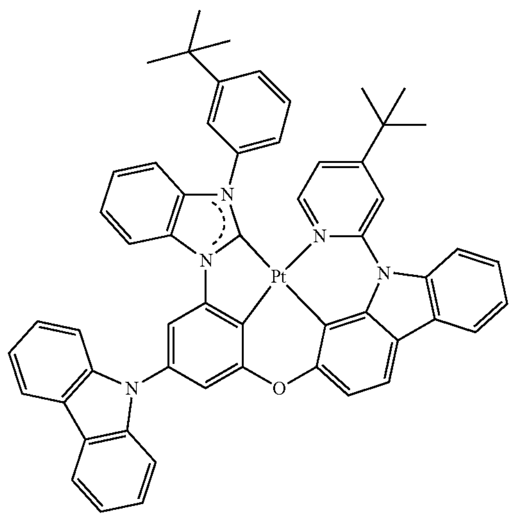
31
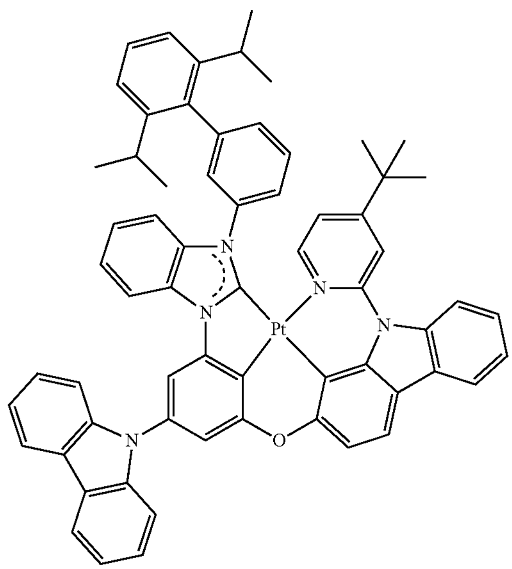
32
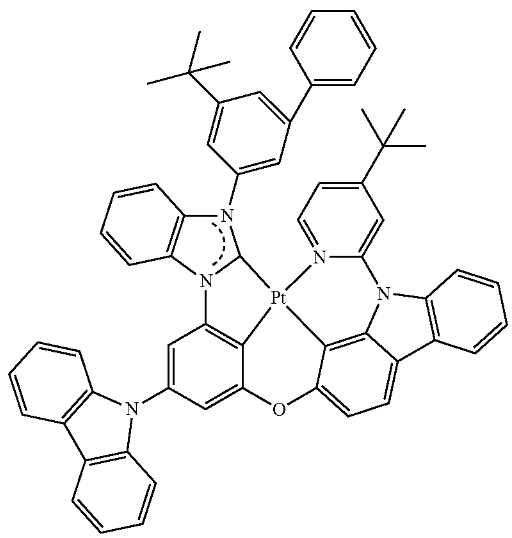
-continued
33
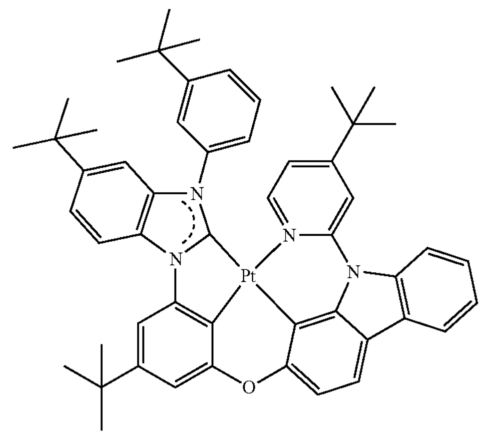
34
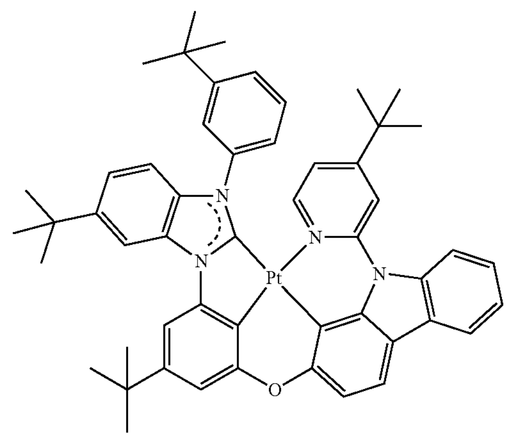
35
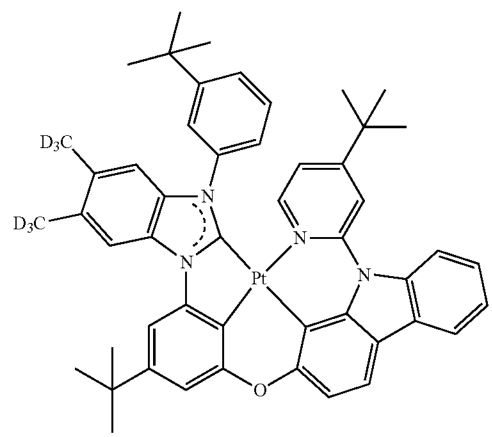

-continued
36
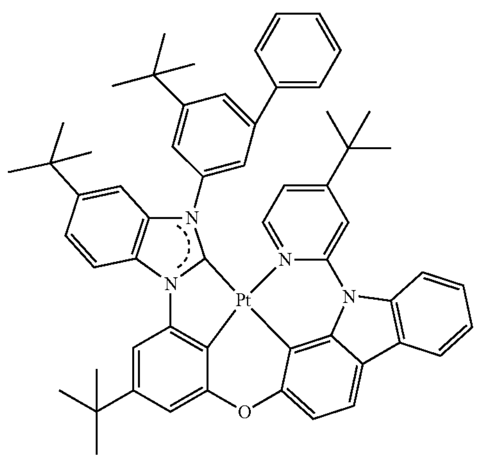
37
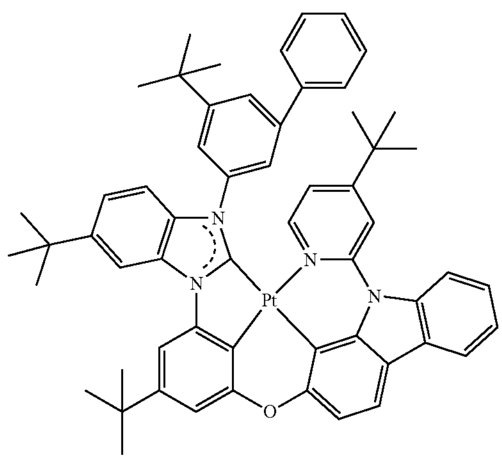
38
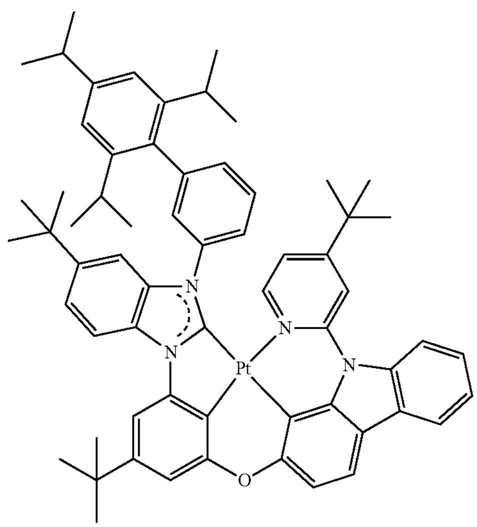
-continued
39
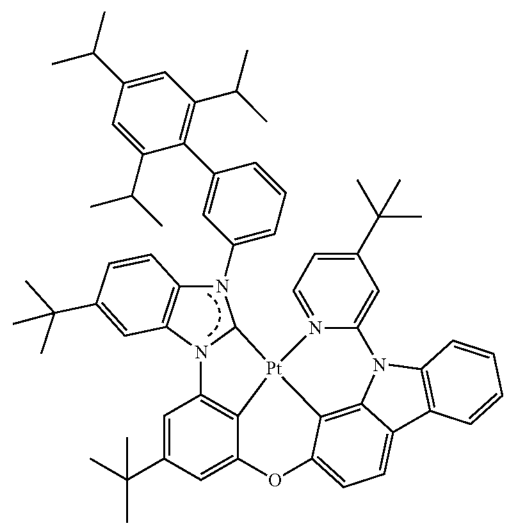
40
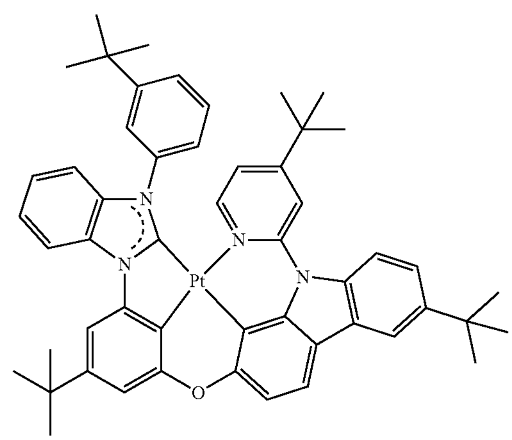
41
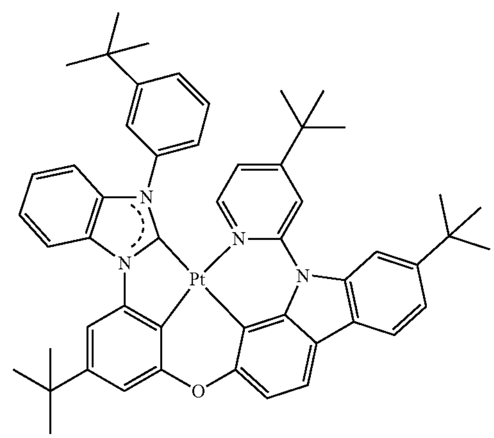

-continued
42
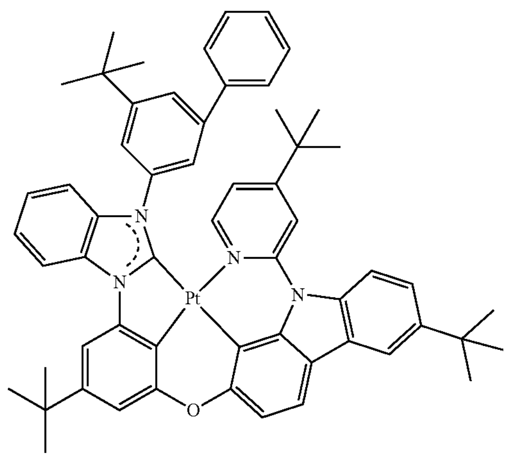
43
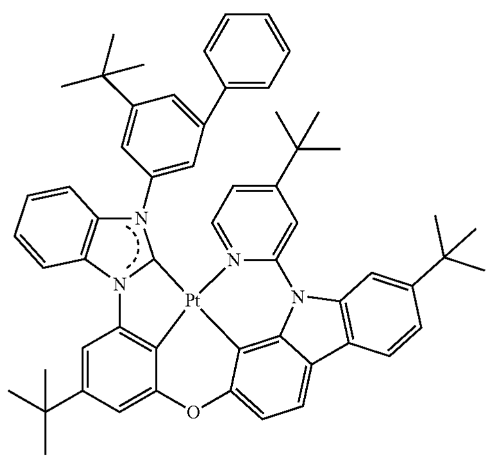
44
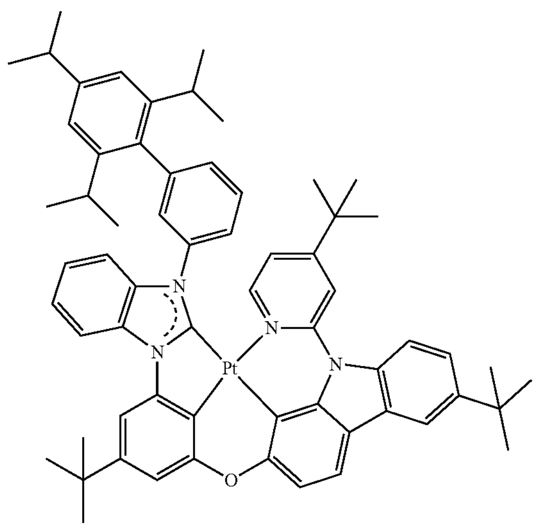
-continued
45
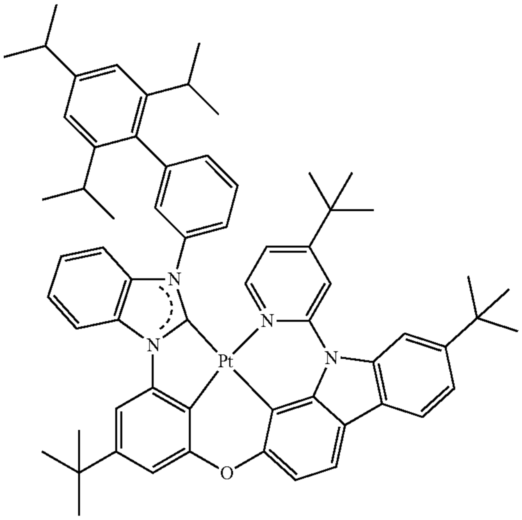
46
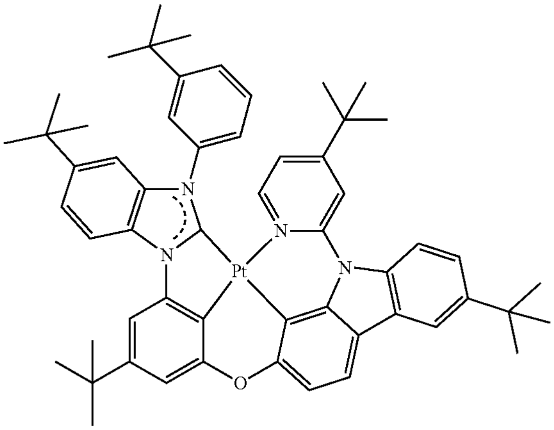
47
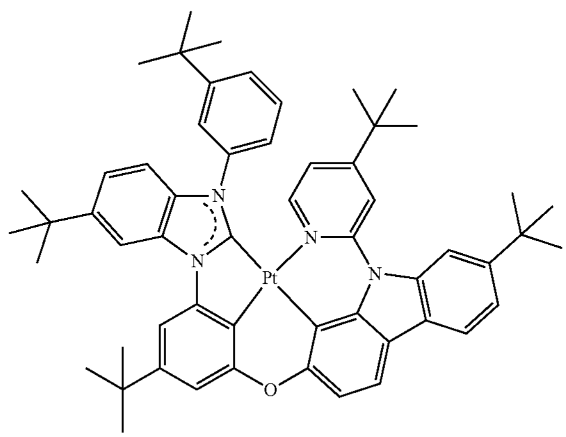

-continued
48
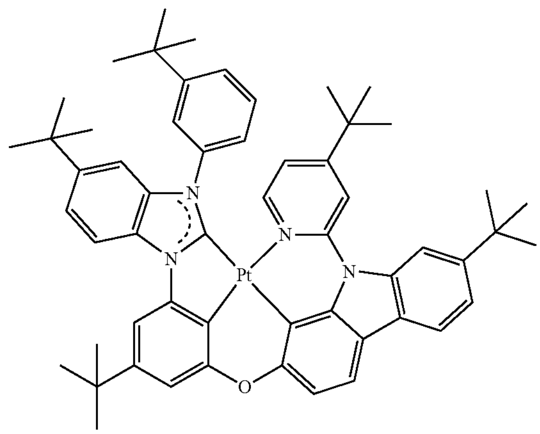
49
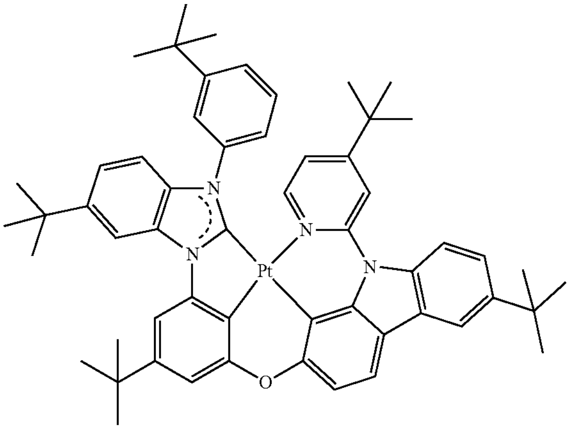
50
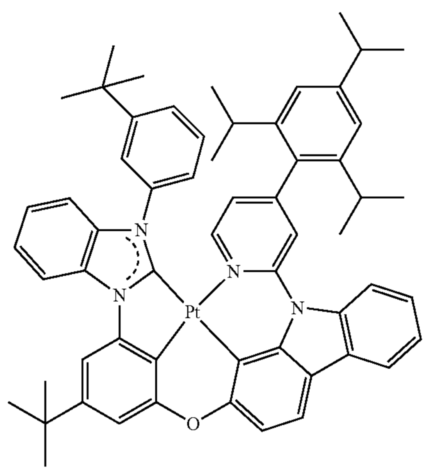
-continued
51
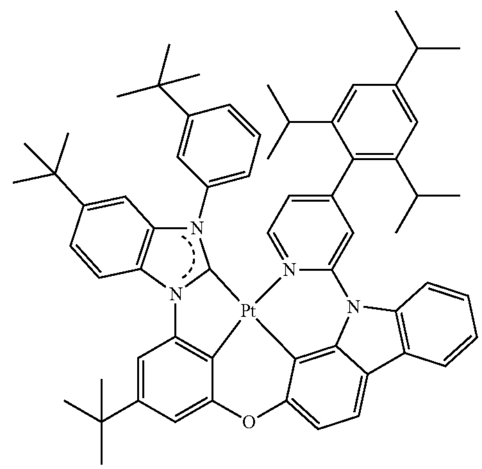
52
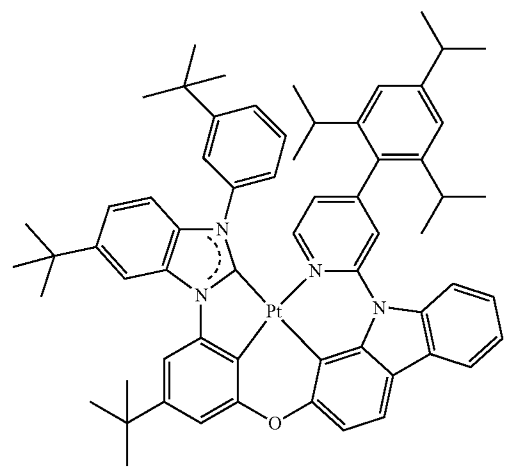
53
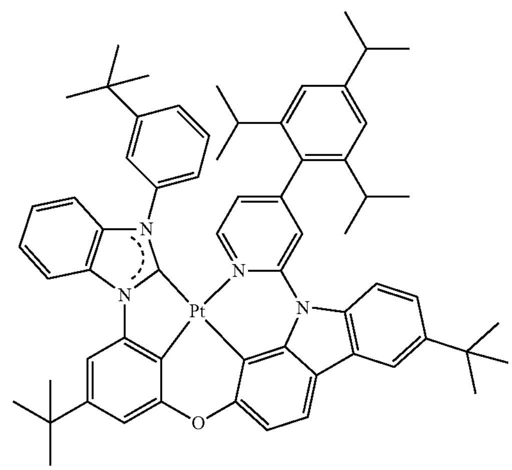

-continued
54
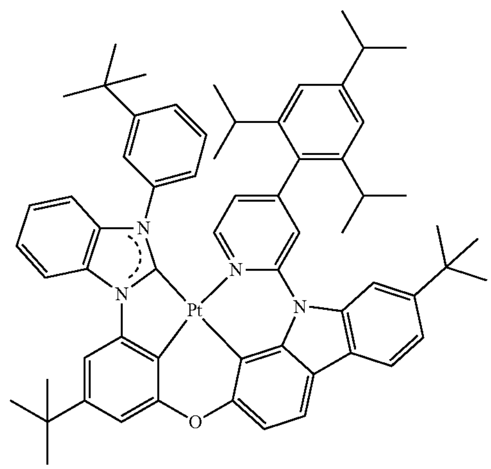
55
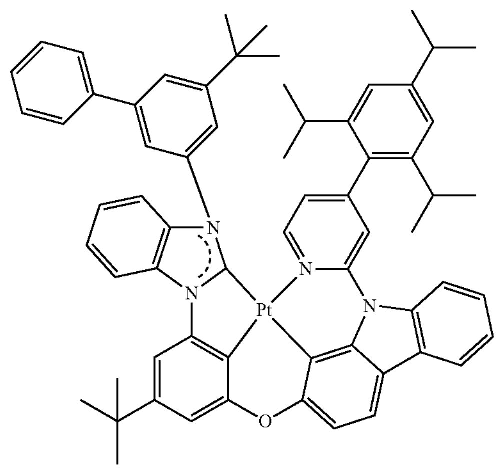
56
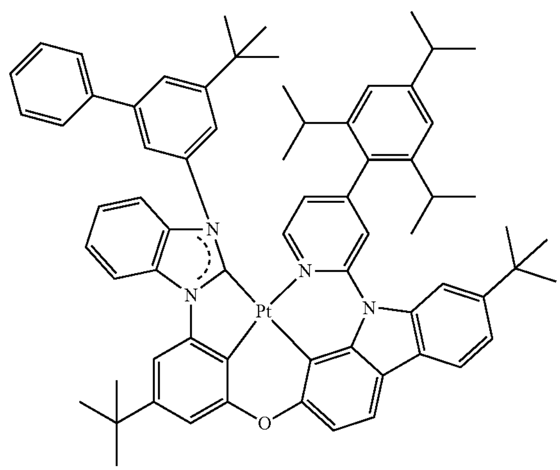
-continued
57
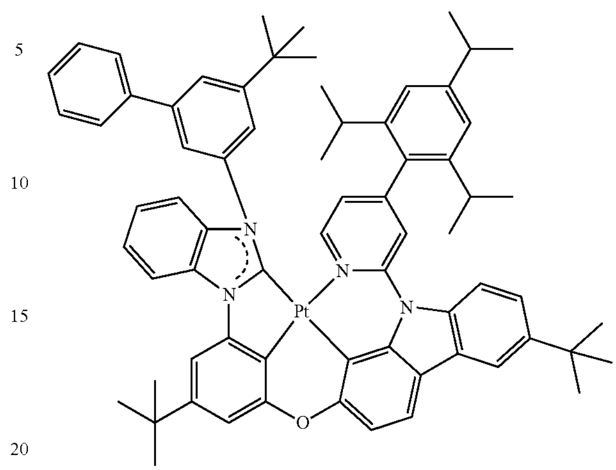
58
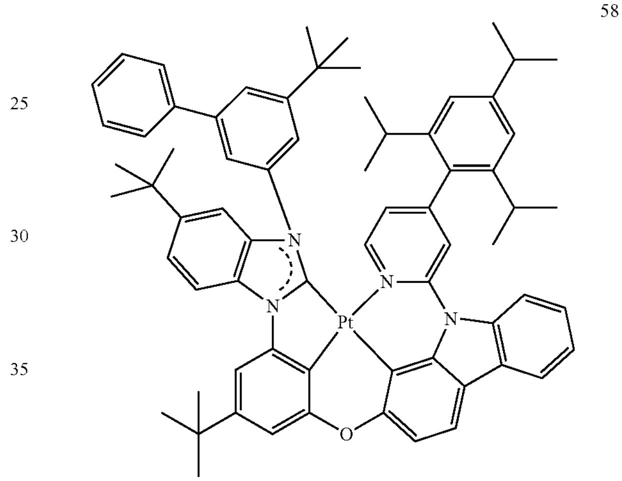
59
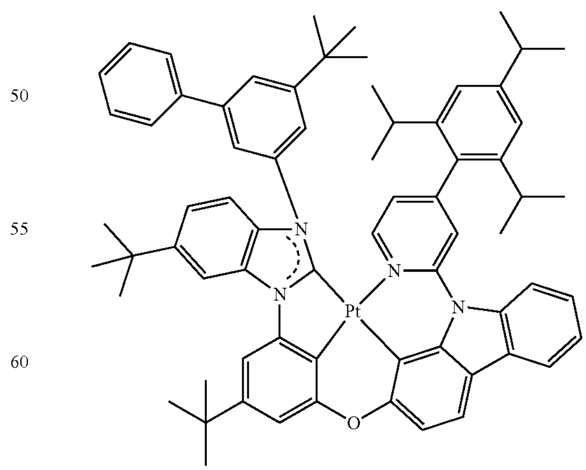

-continued
60
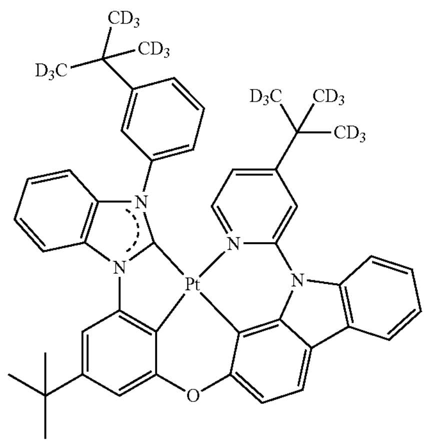
61
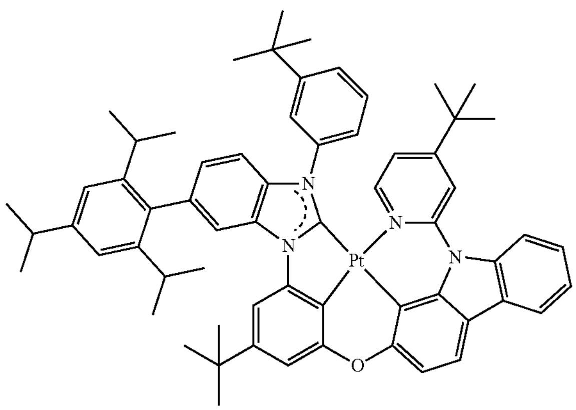
62
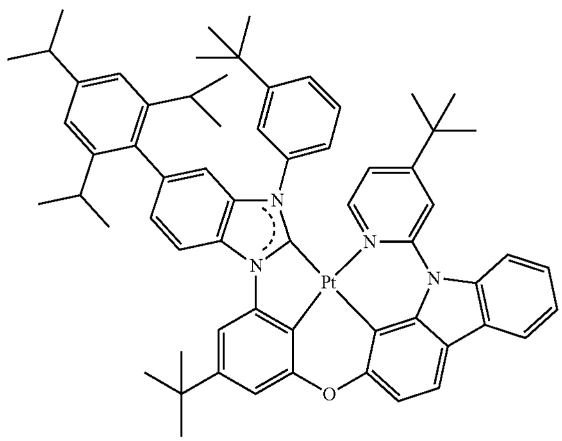
-continued
63
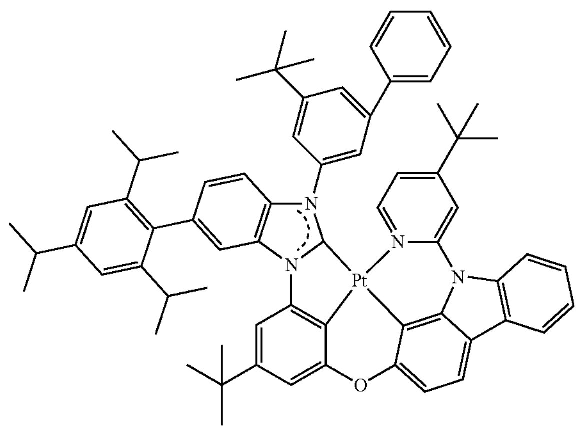
64
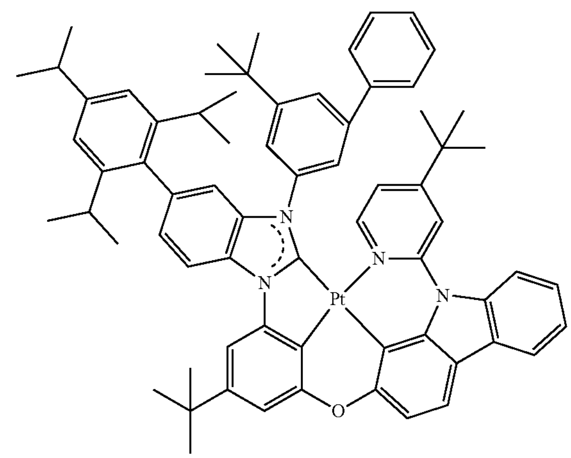
65
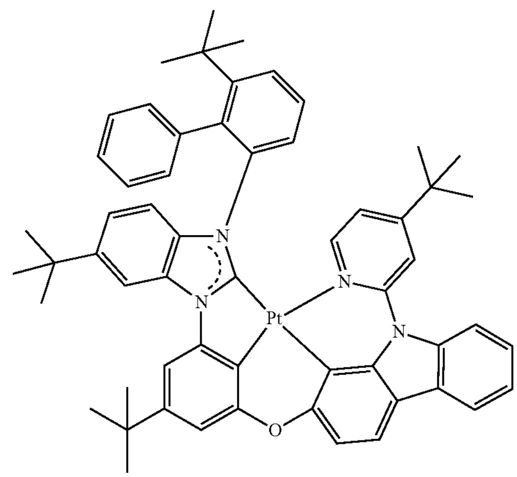

-continued
66
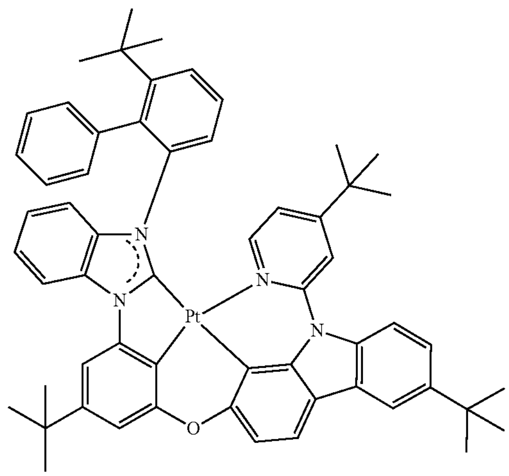
67
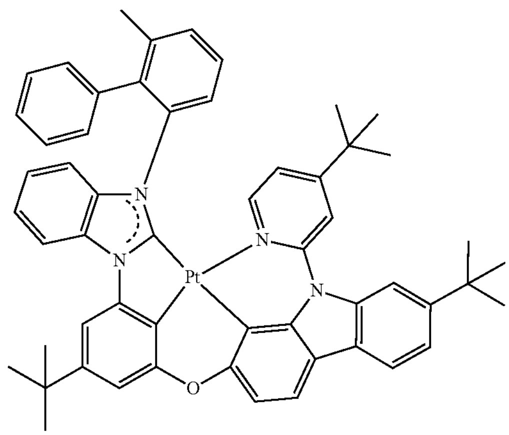
68
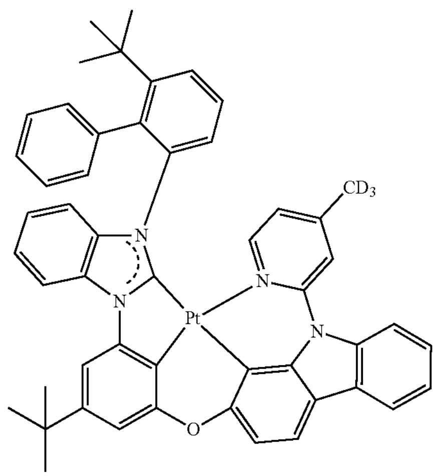
-continued
69
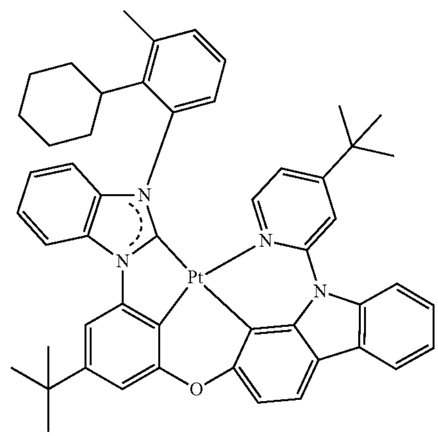
70
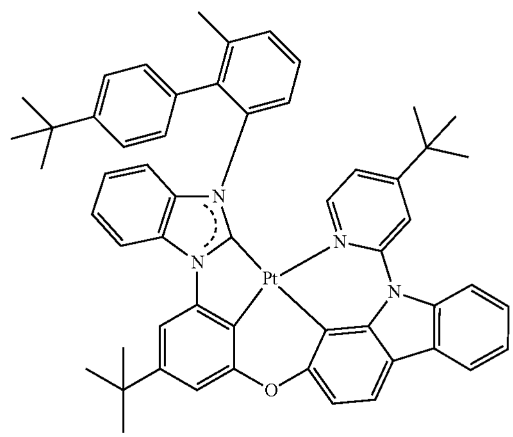
71
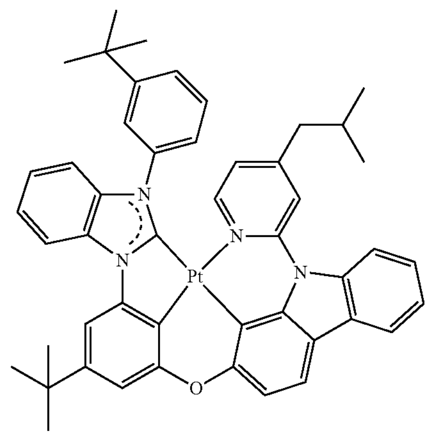

-continued
72
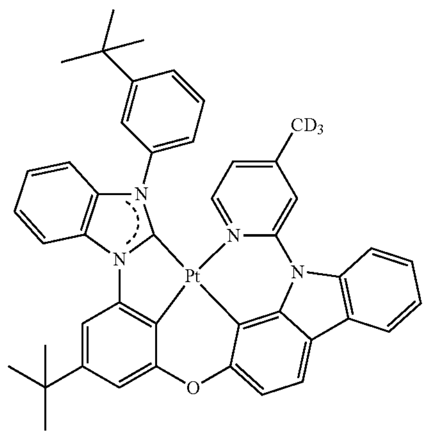
73
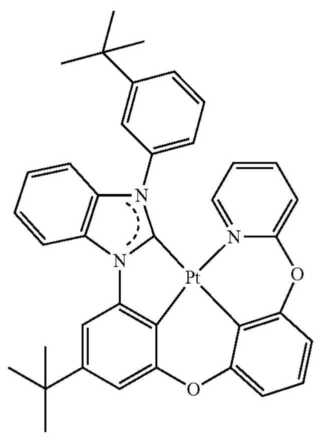
74
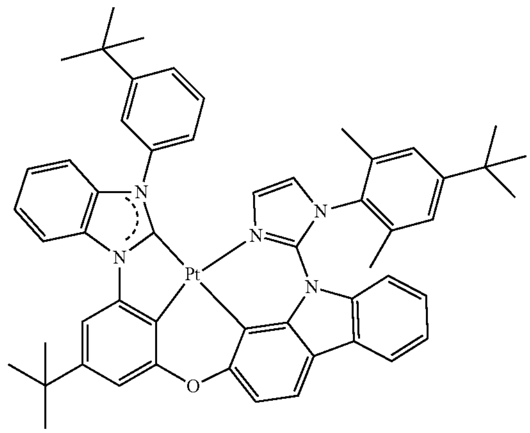
-continued
75
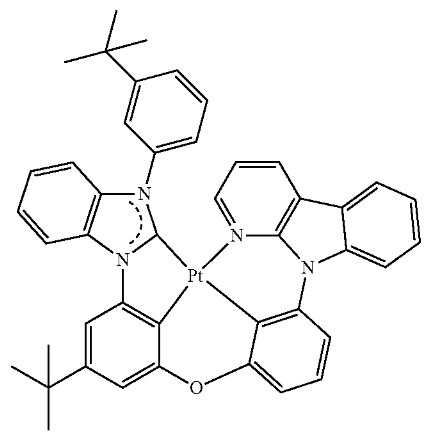
76
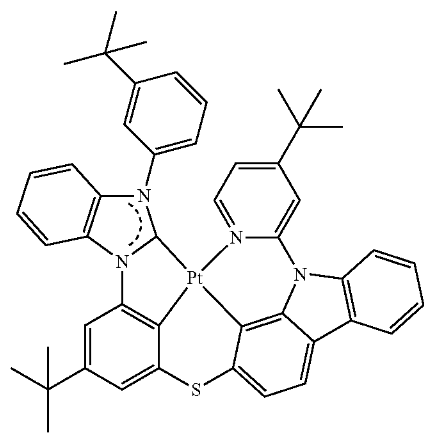
77
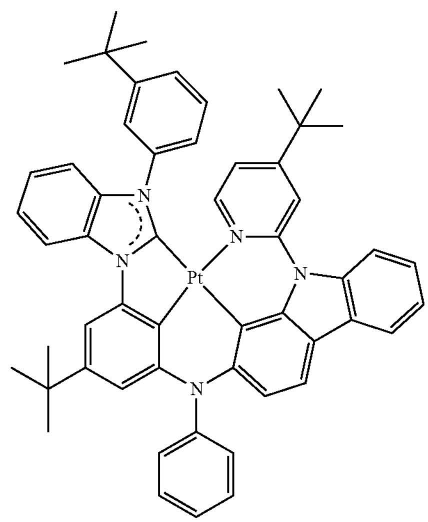

-continued
78
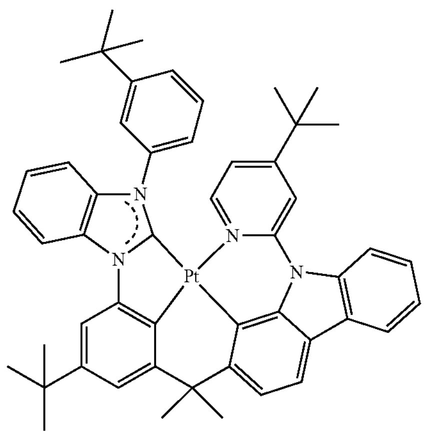
79
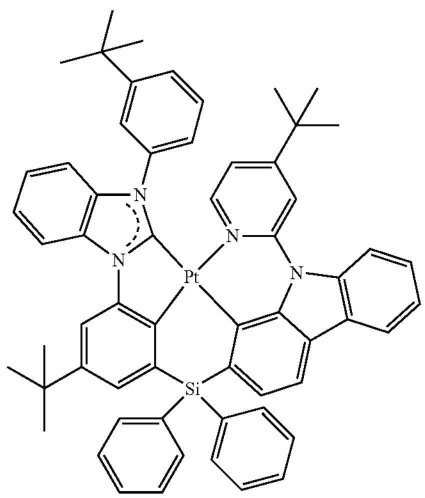
80
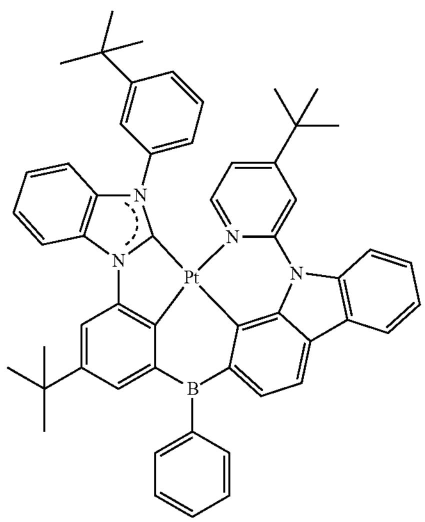
-continued
81
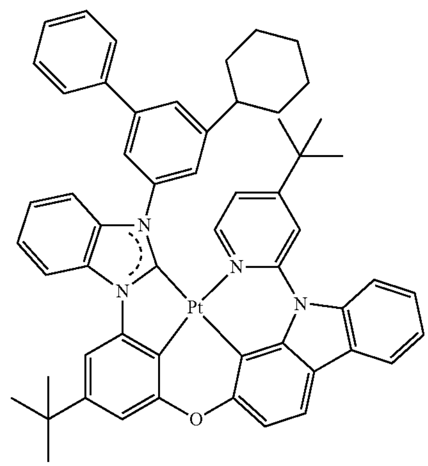
82
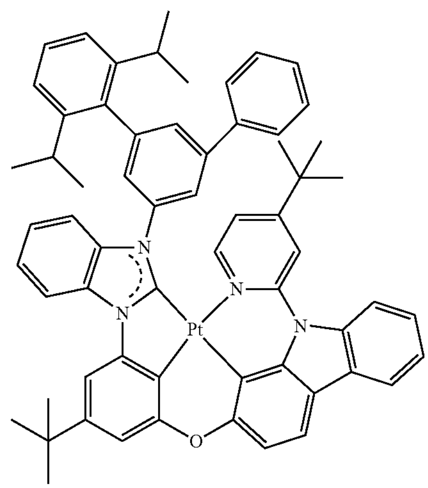
83
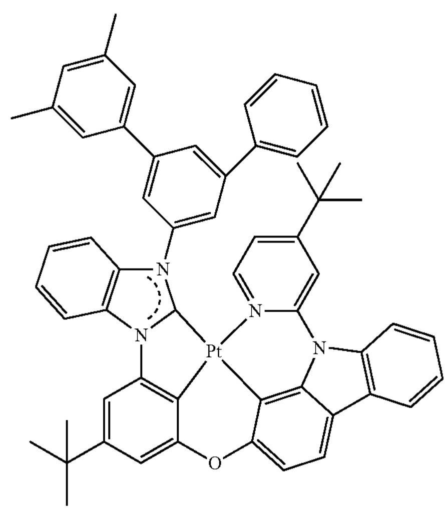

-continued
84
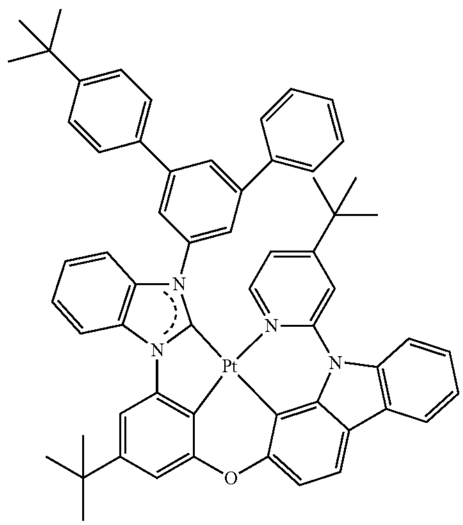
85
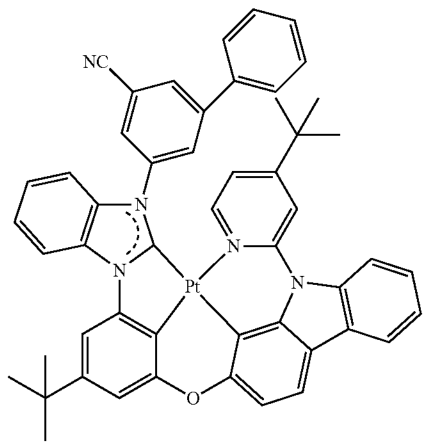
86
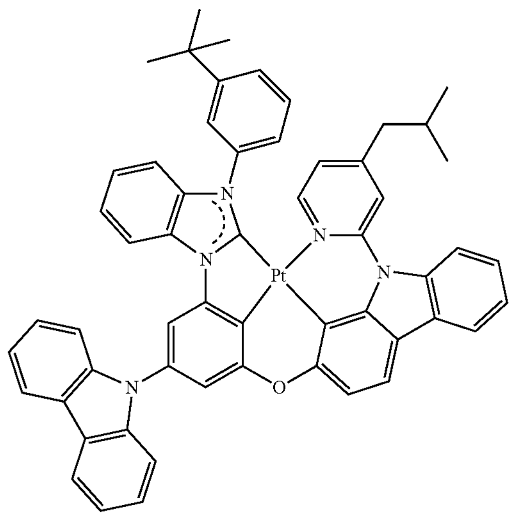
-continued
87
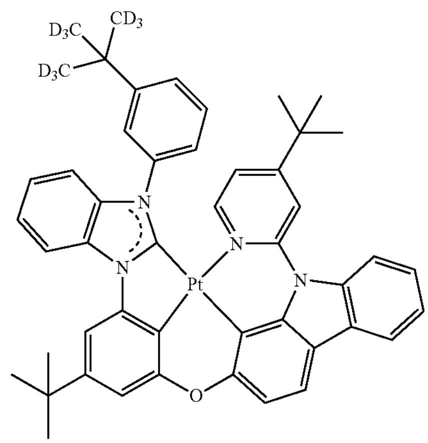
88
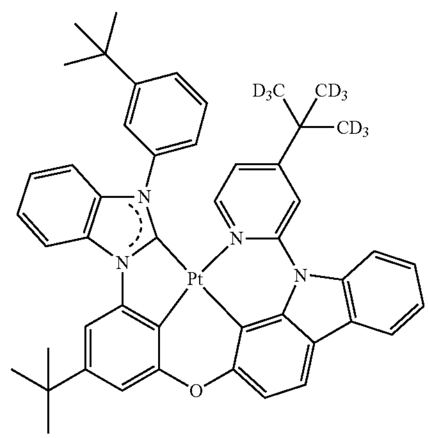
89
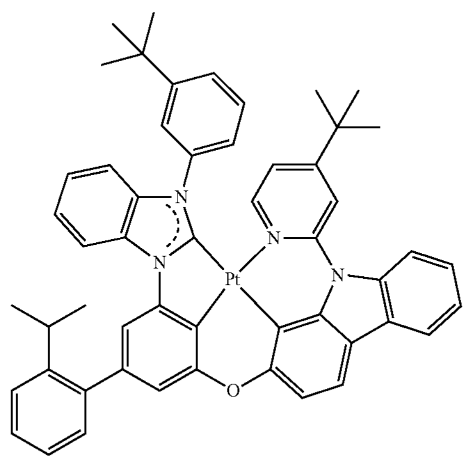

-continued
90
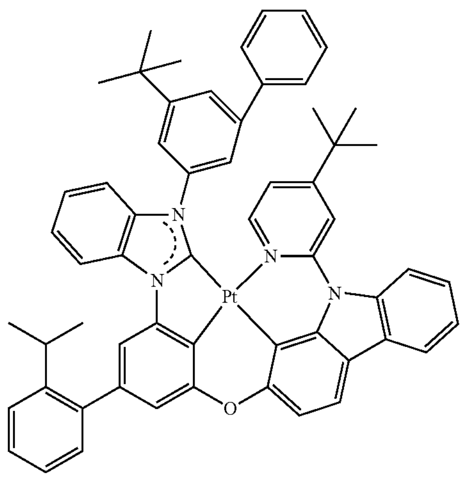
91
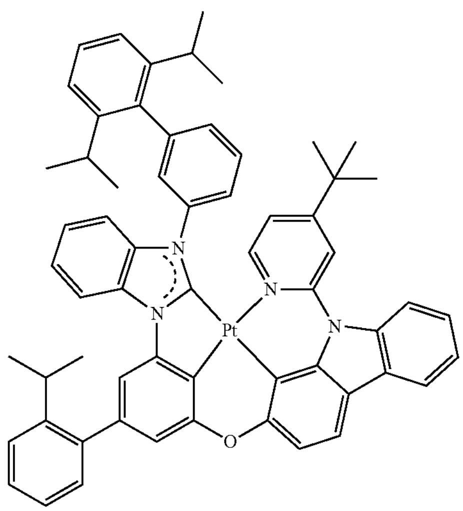
92
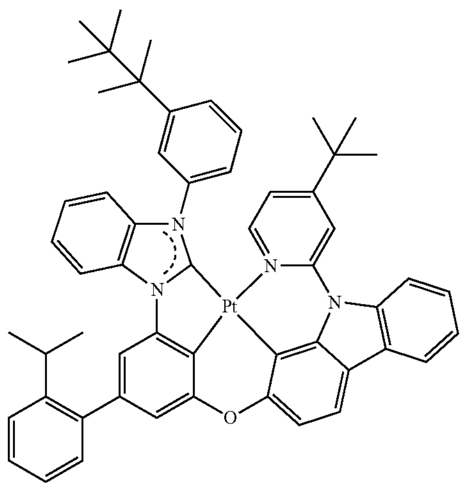
-continued
93
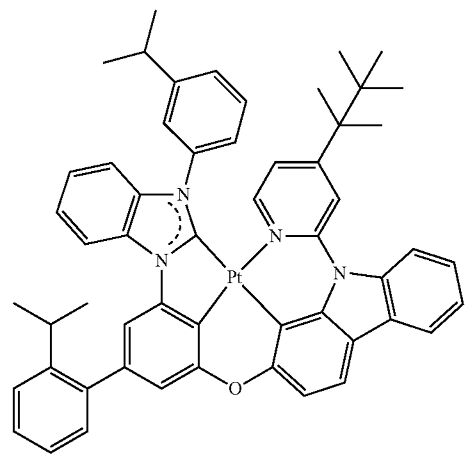
94
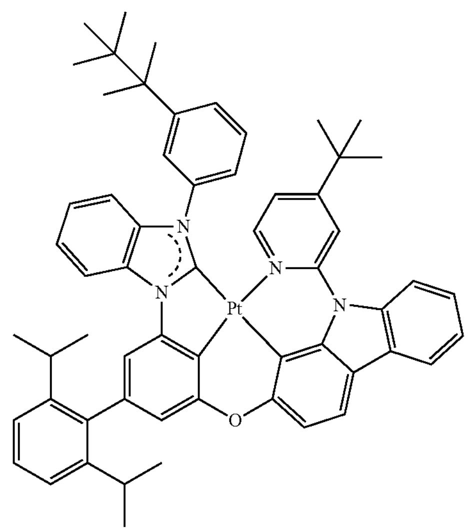
95
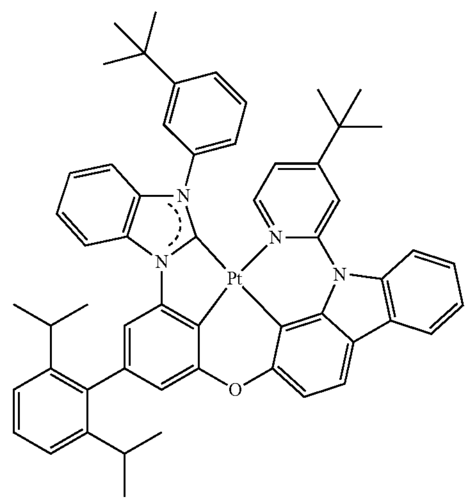

-continued
96
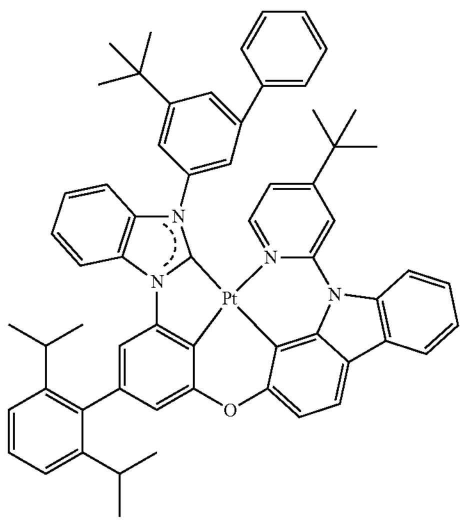
97
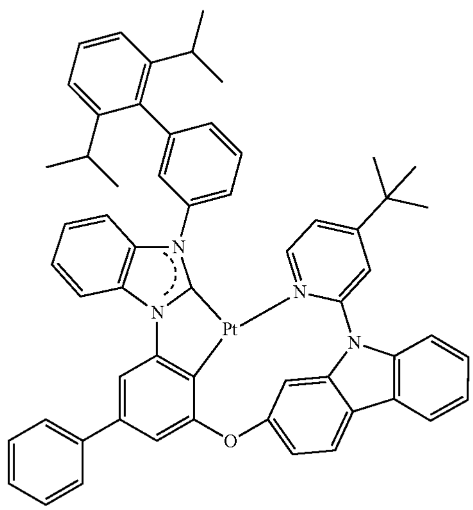
98
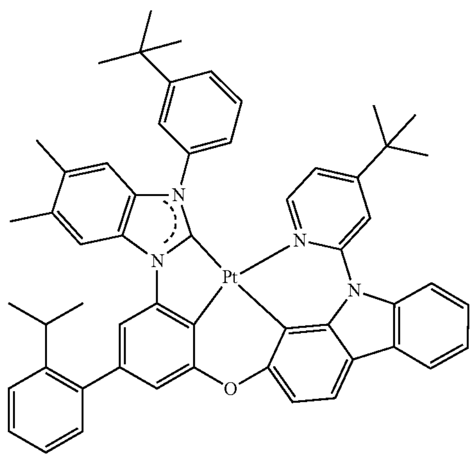
-continued
99
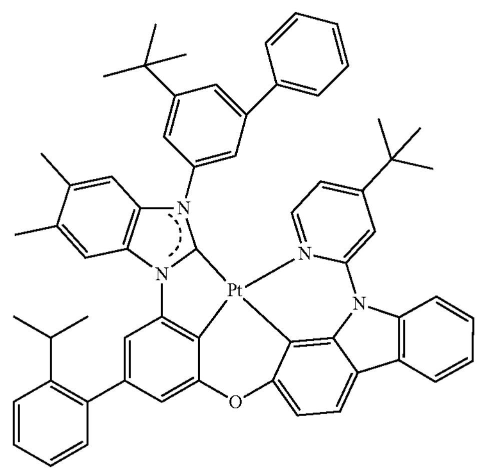
100
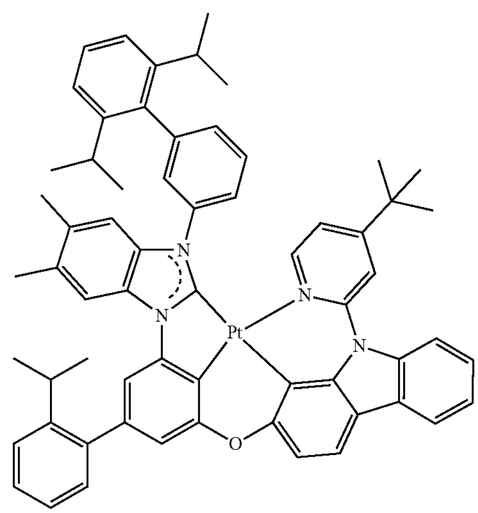
101
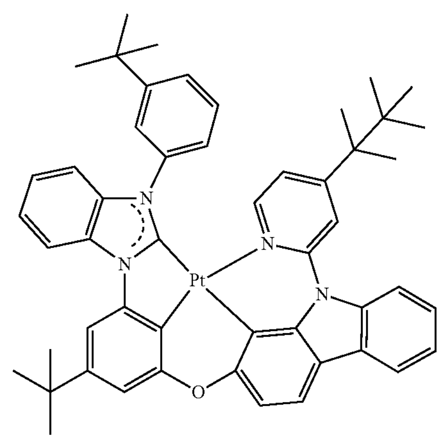

-continued
102
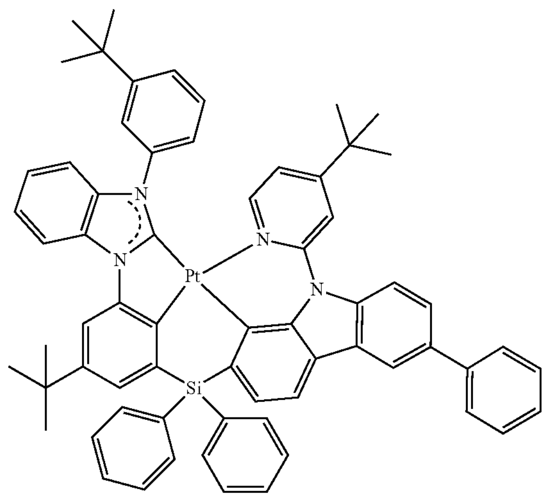
103
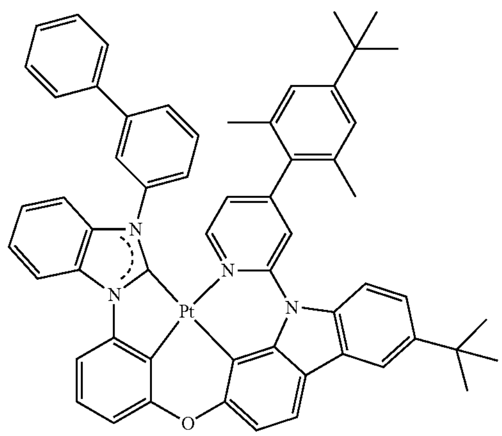
104
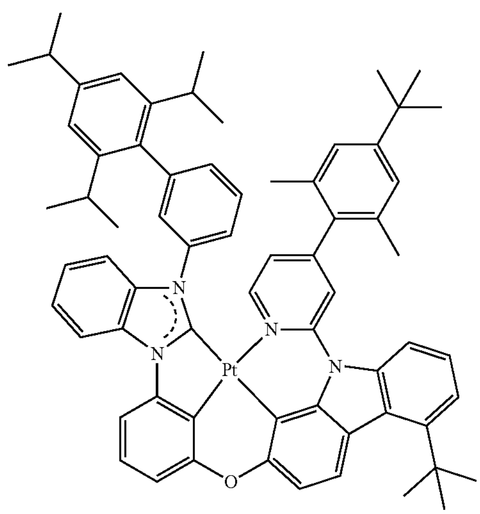
-continued
105
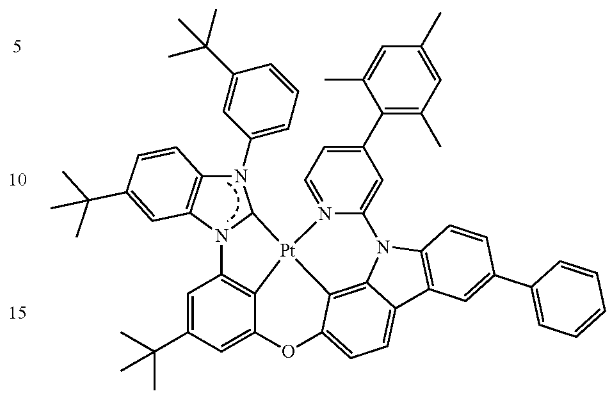
106
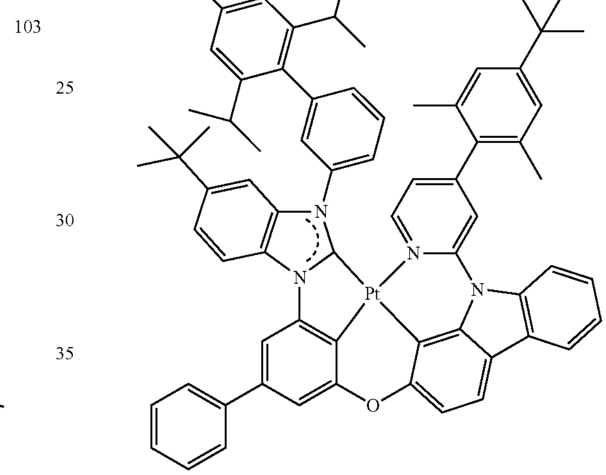
107
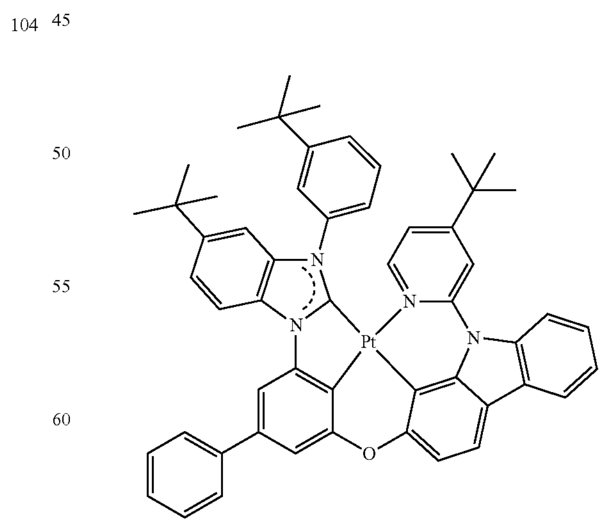

-continued
108
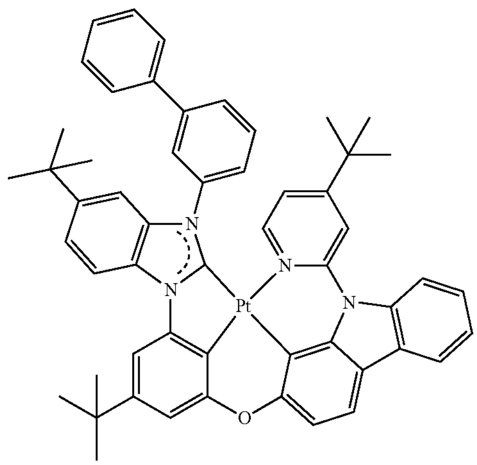
109
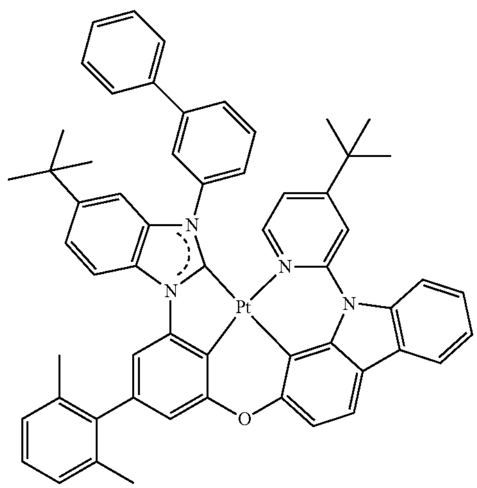
110
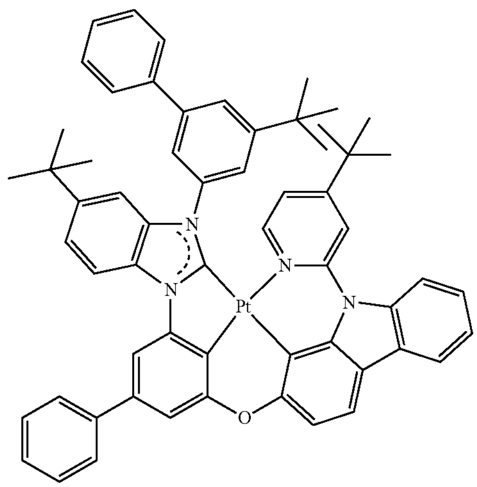
-continued
111
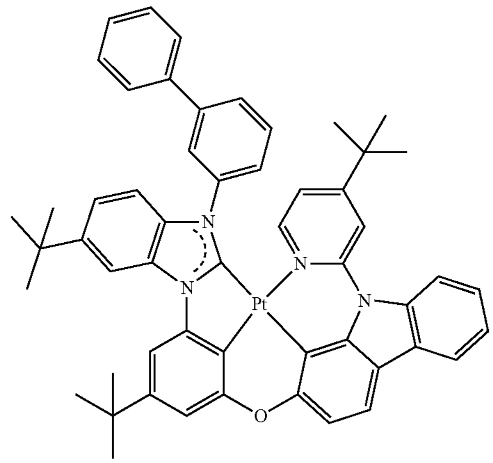
112
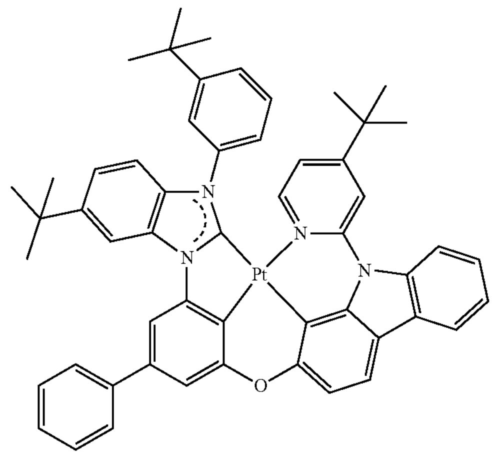
113
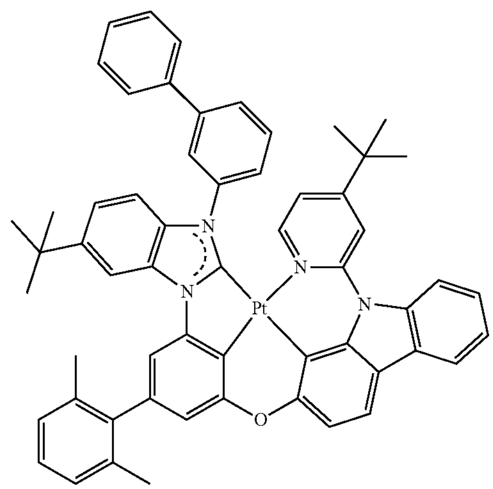

-continued
114
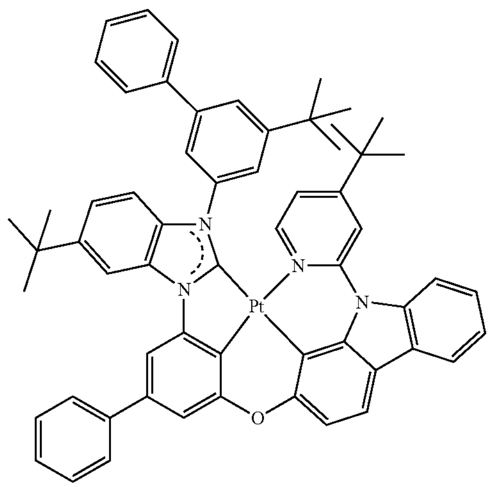
115
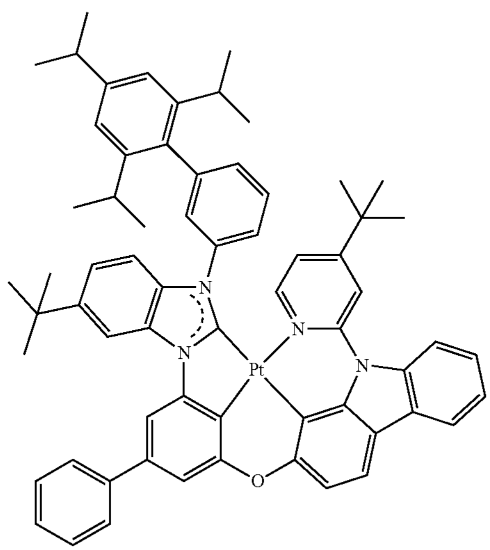
116
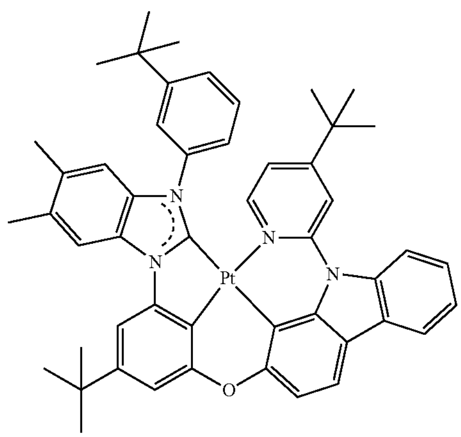
-continued
117
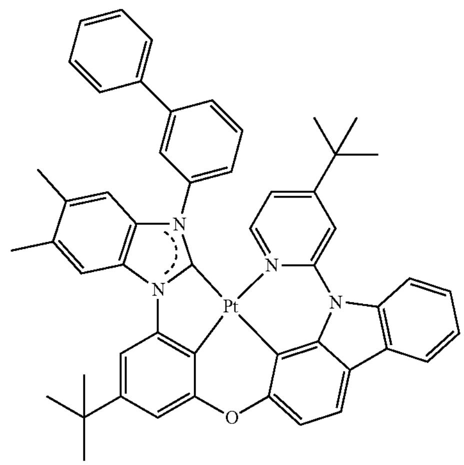
118
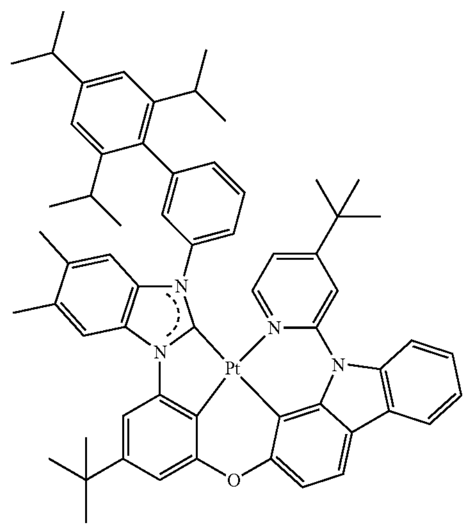
119
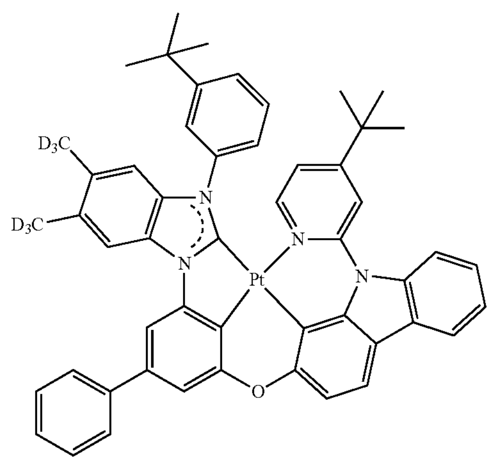

-continued
120
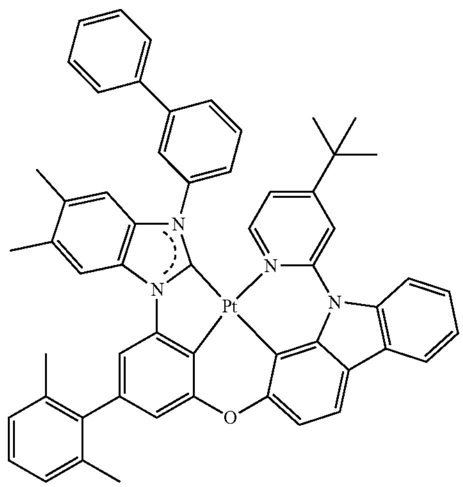
121
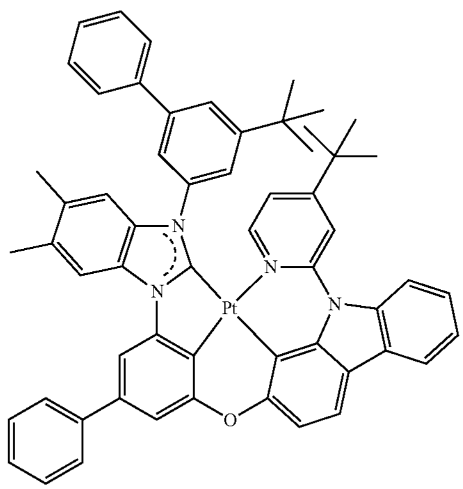
122
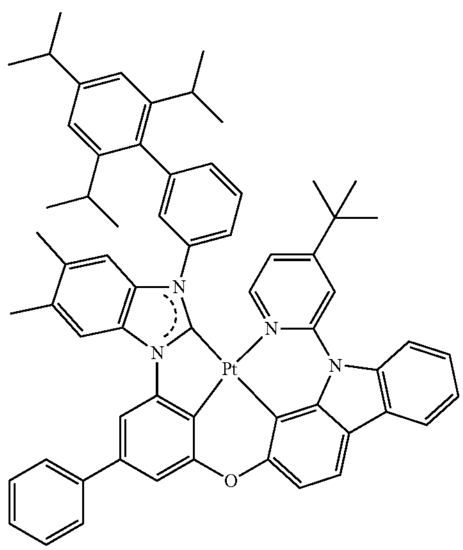
-continued
123
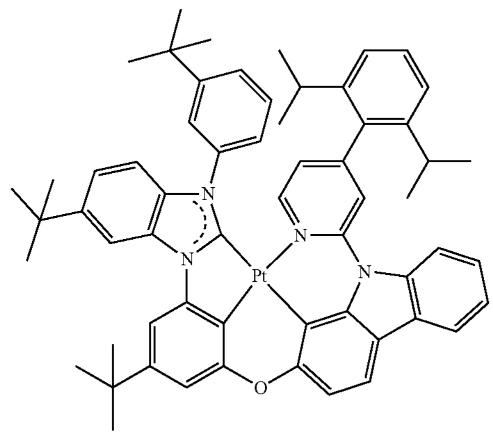
124
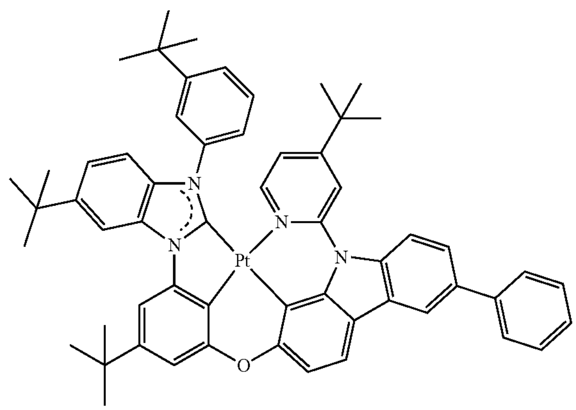
125
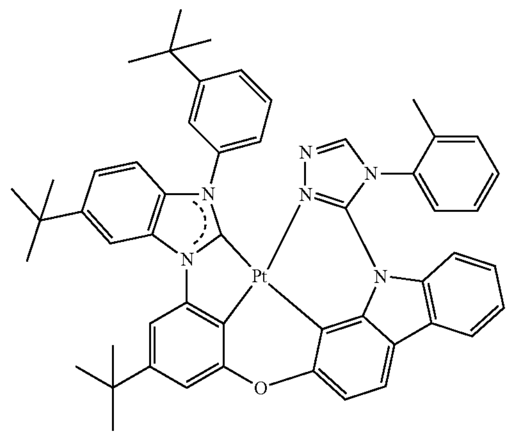

-continued
126
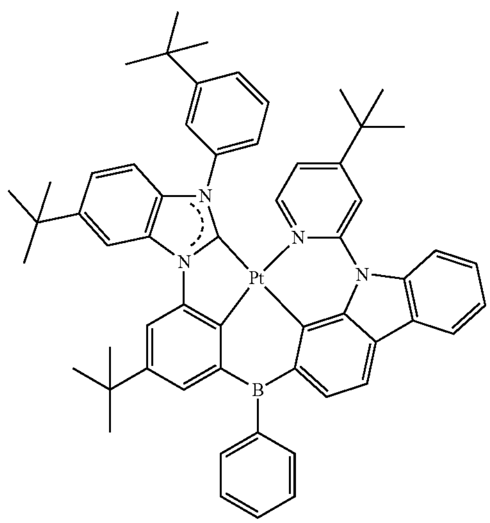
127
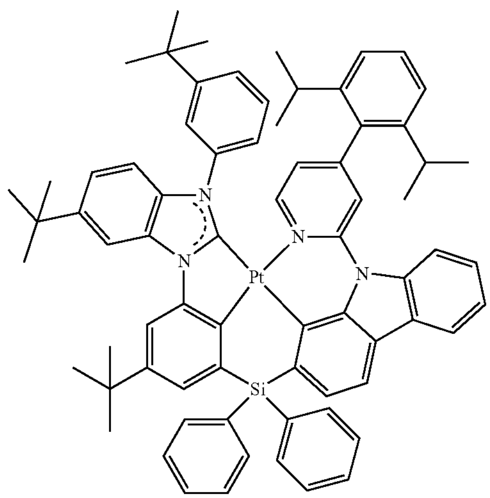
128
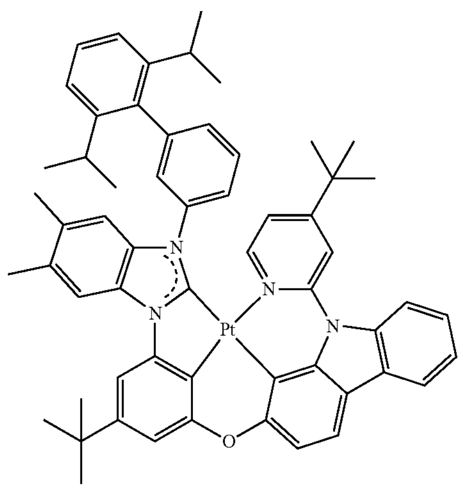
-continued
129
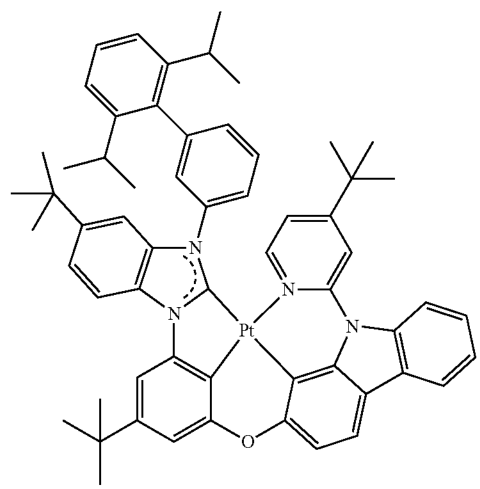
130
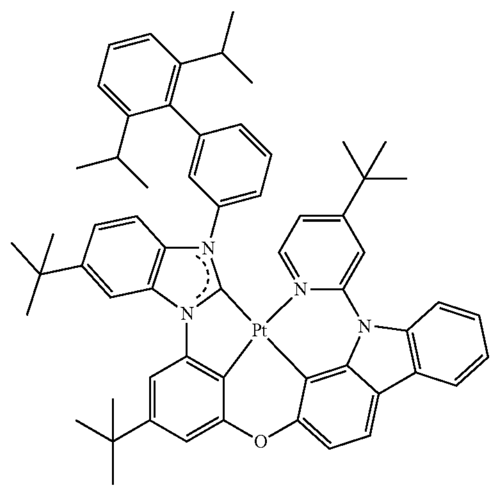
131
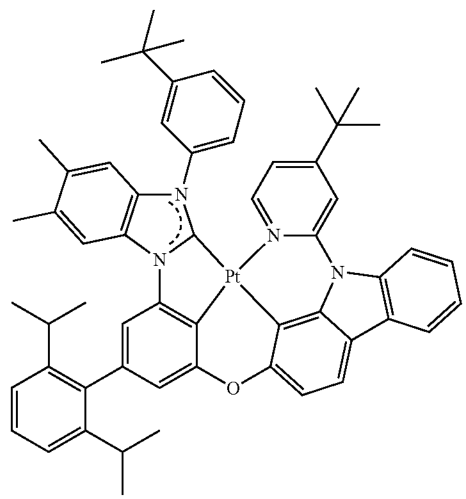

-continued
132
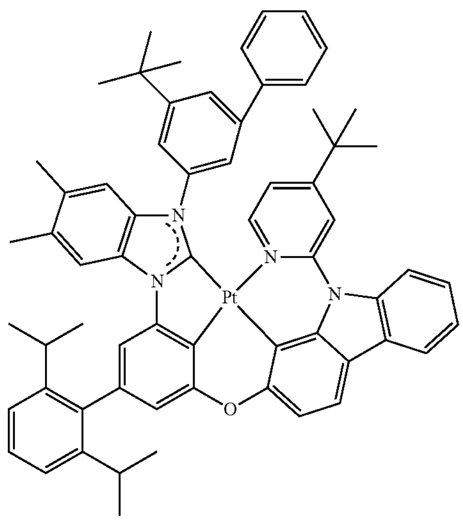
133
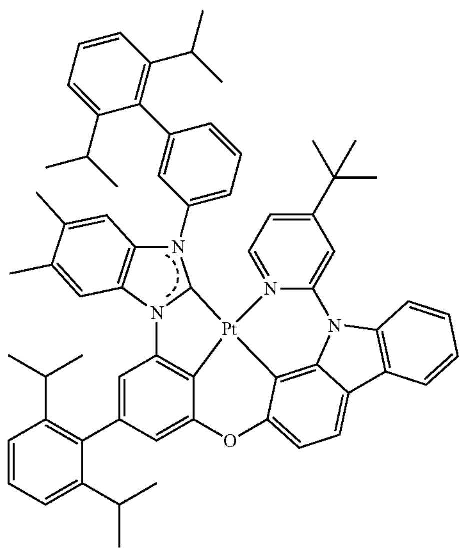
134
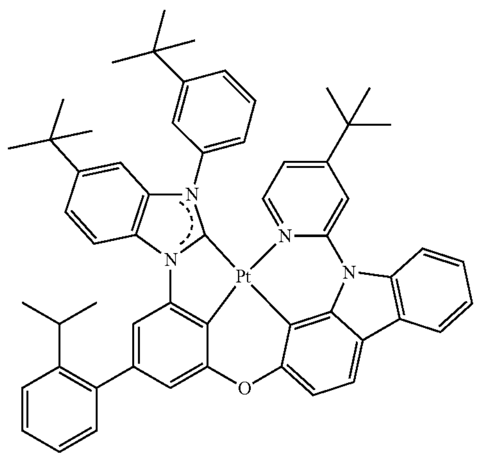
-continued
135
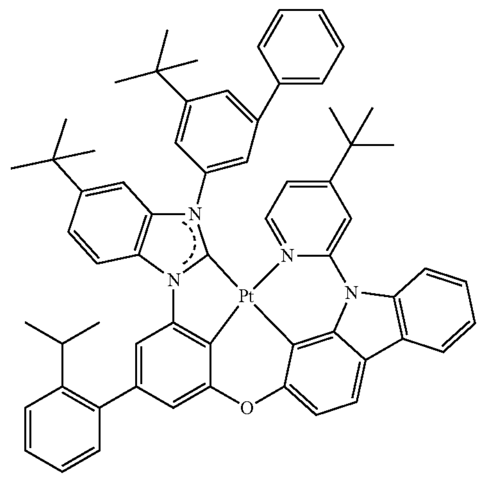
136
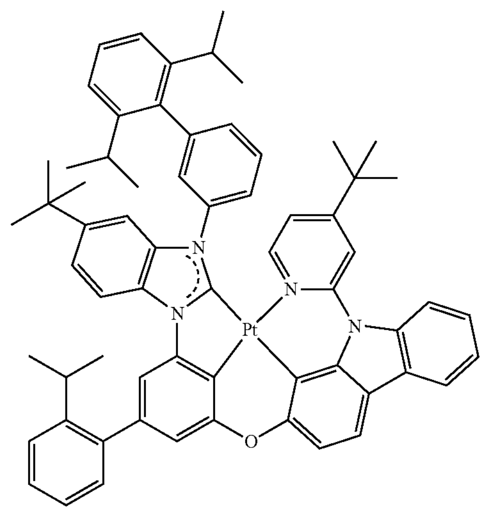
137
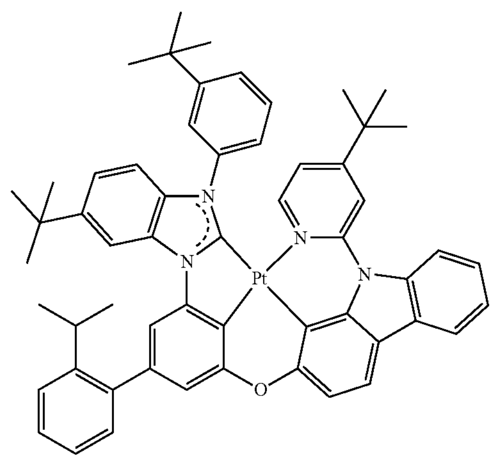

-continued
138
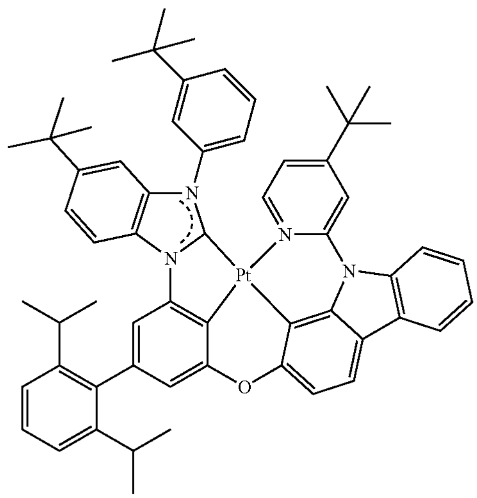
139
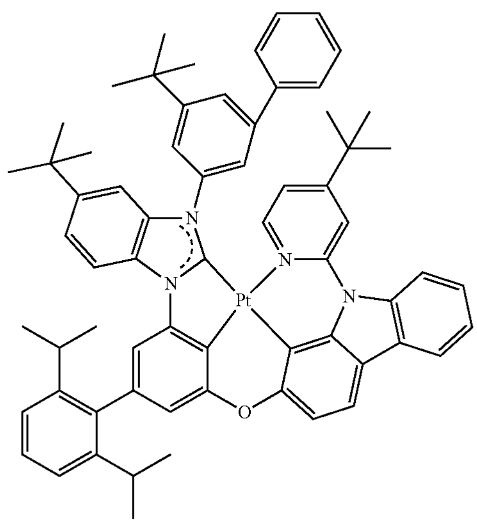
140
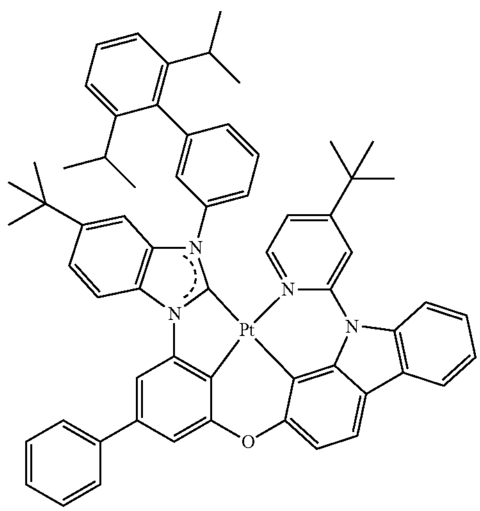
-continued
141
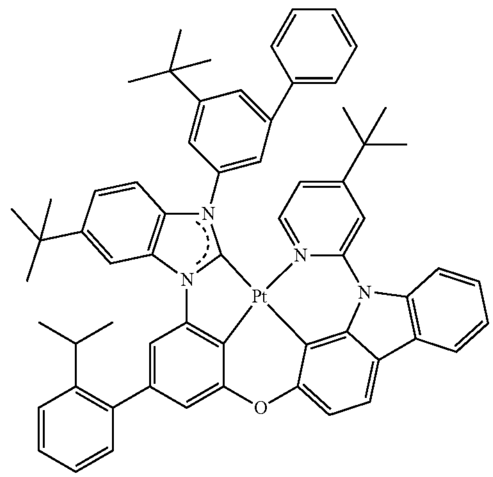
142
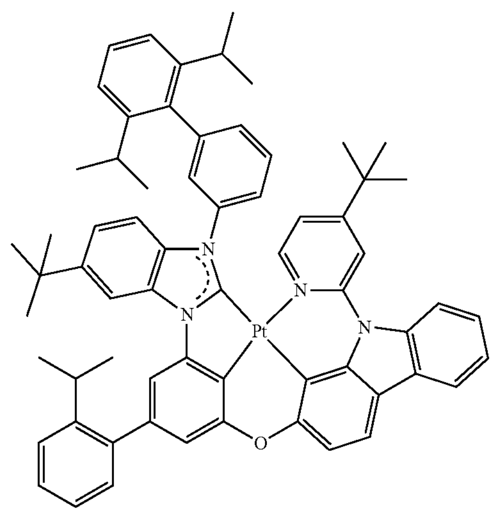
143
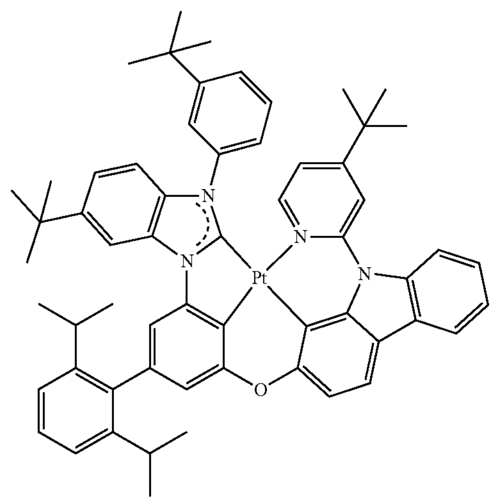

144
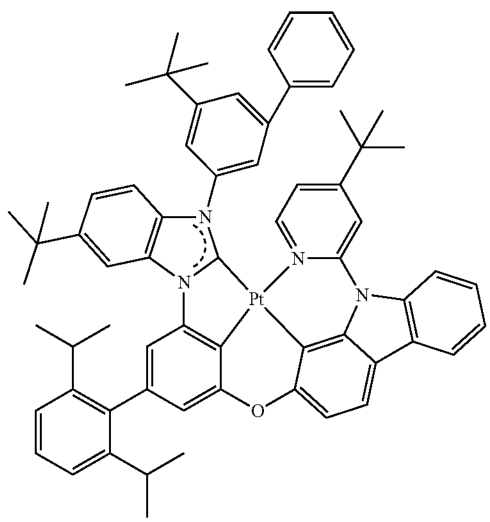
145
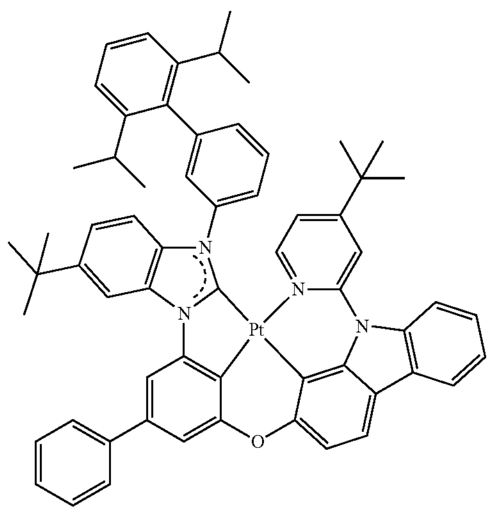
146
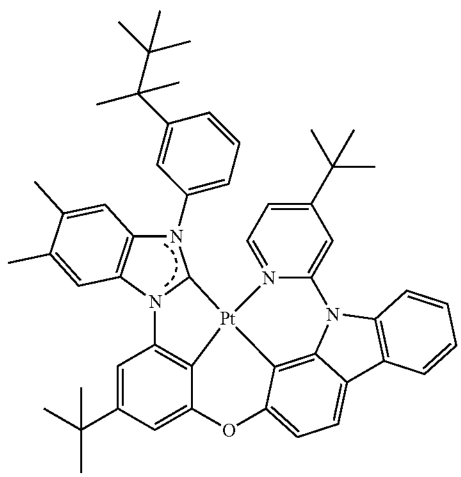
147
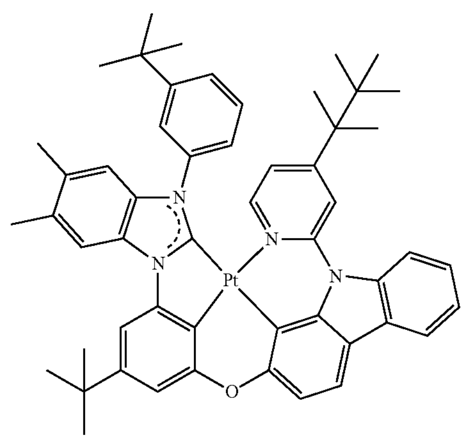
148
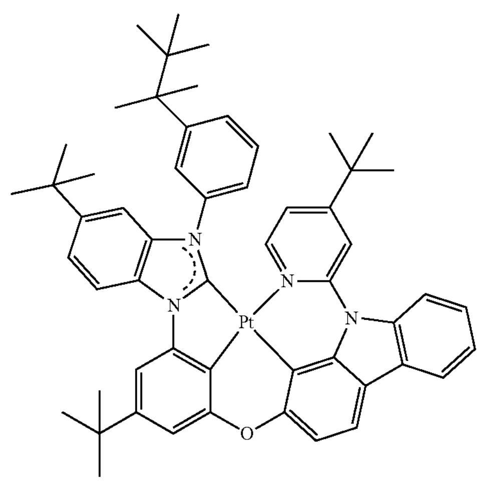
149
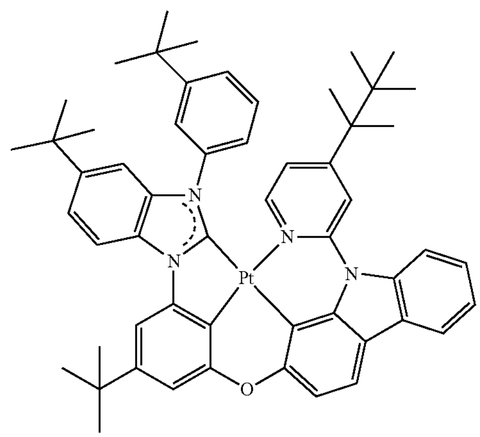

-continued
150
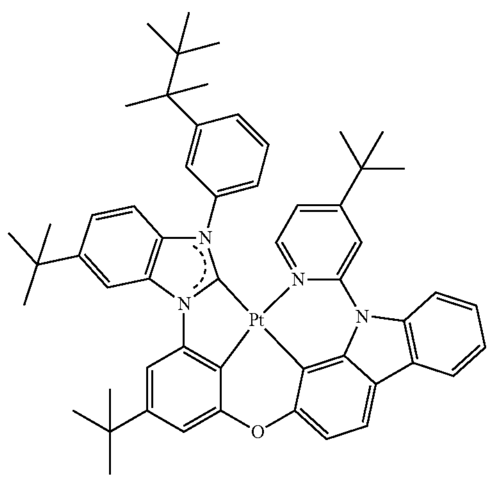
151
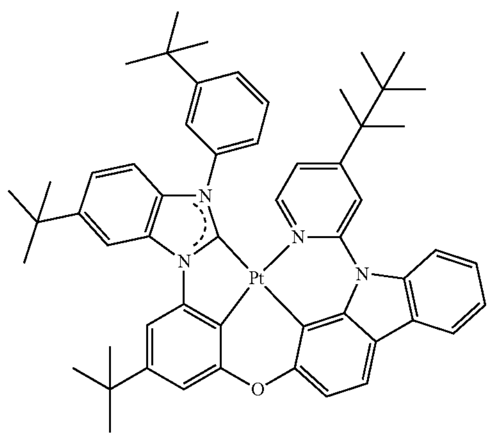
152
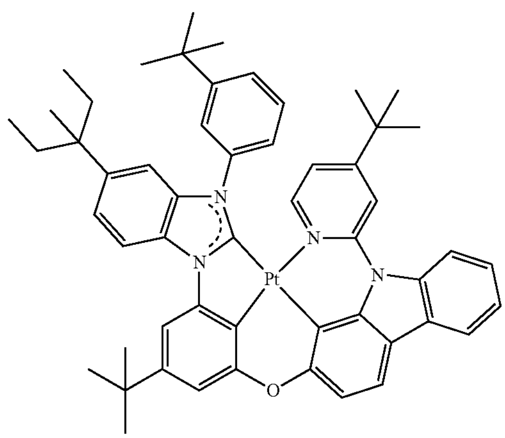
-continued
153
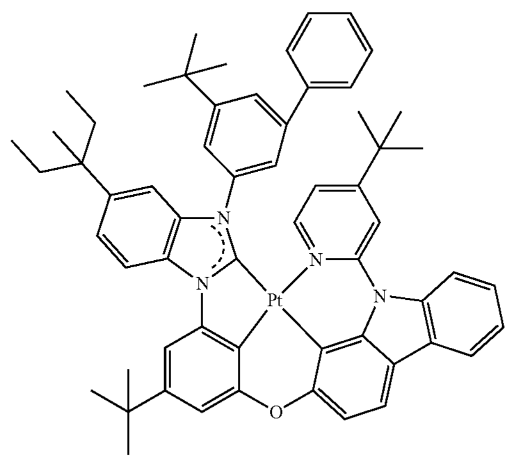
154
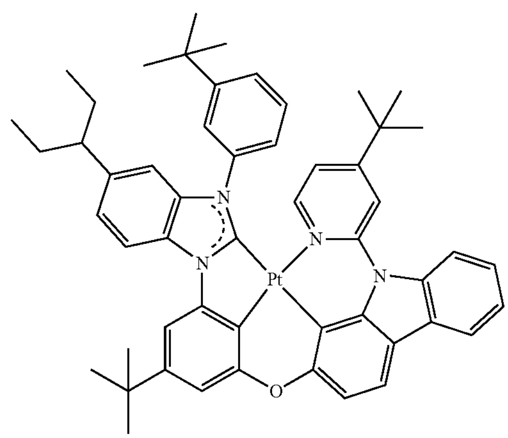
155
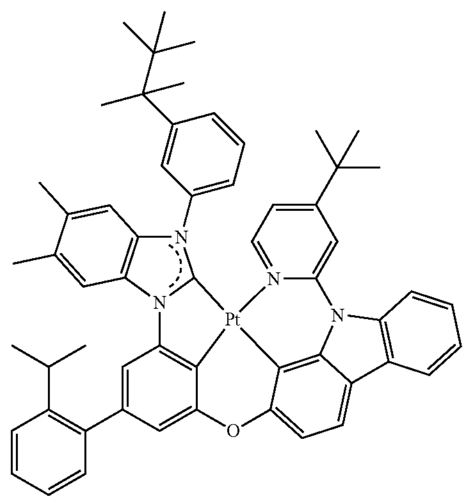

-continued
156
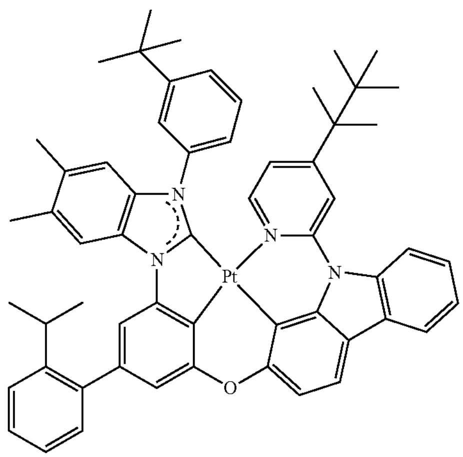
157
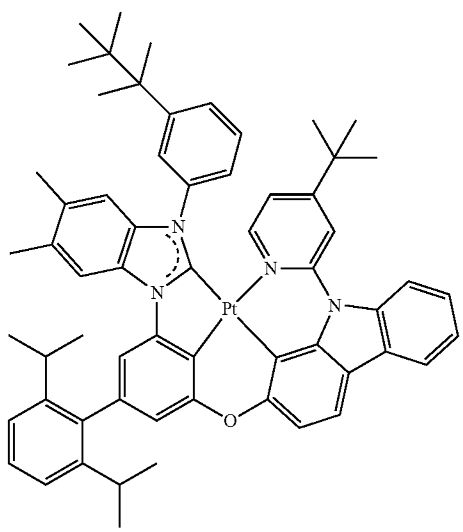
158
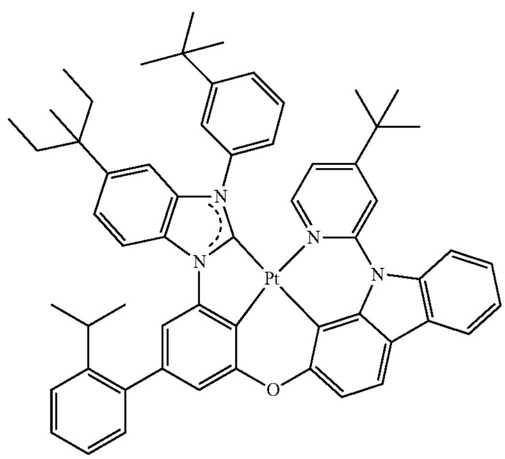
-continued
159
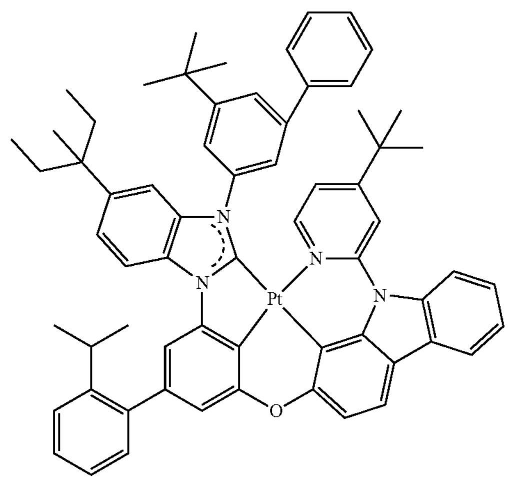
160
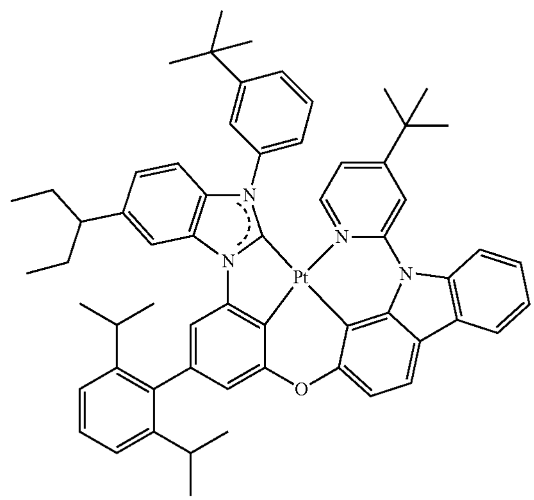
161
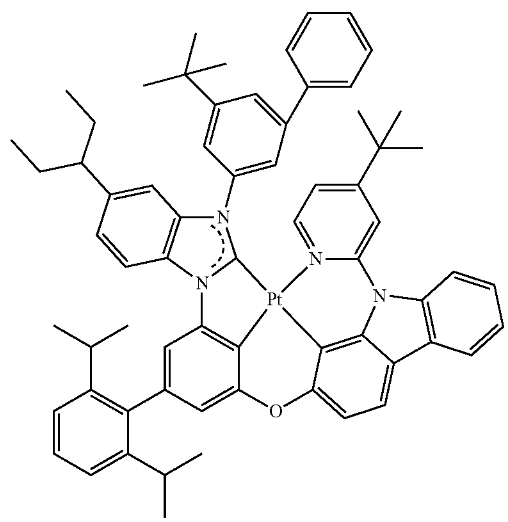

-continued
162
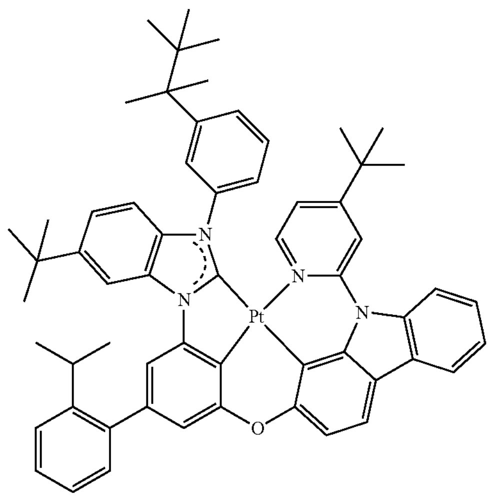
163
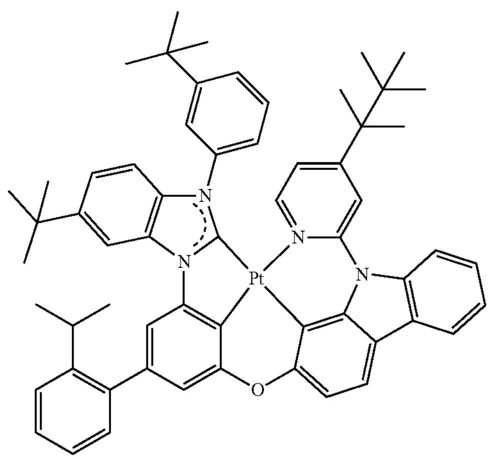
164
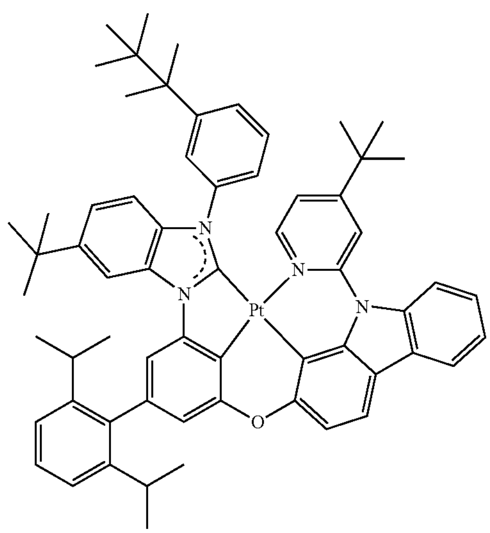
165
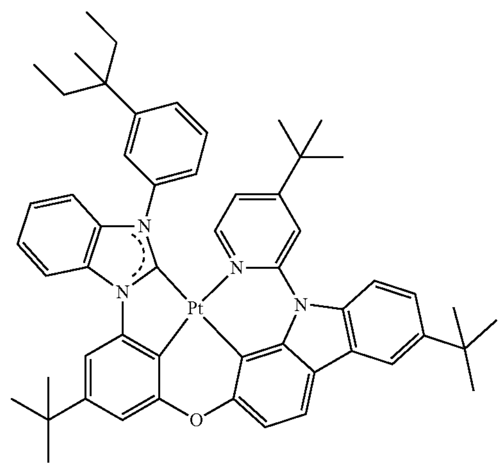
166
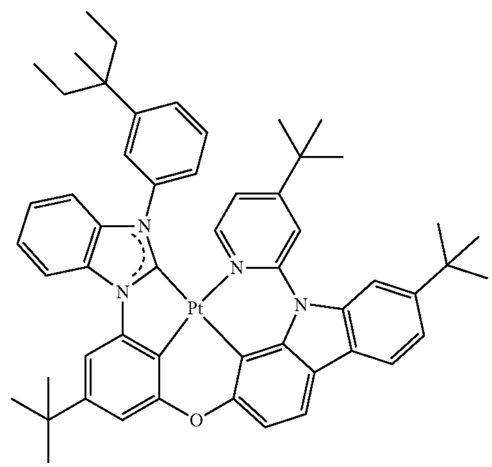
167
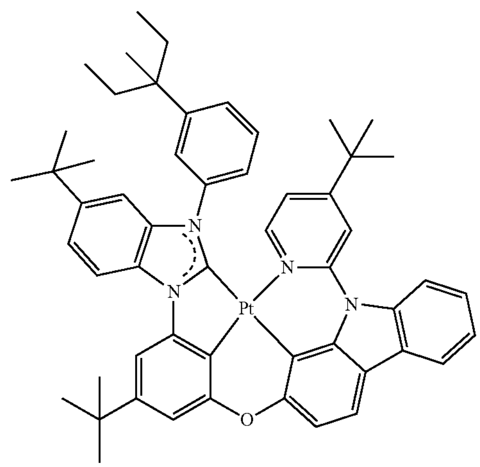

-continued
168
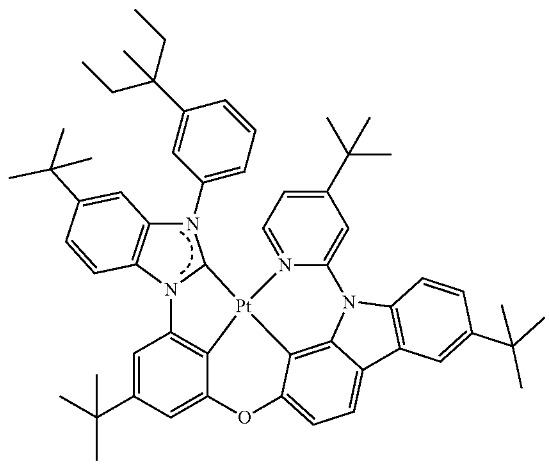
169
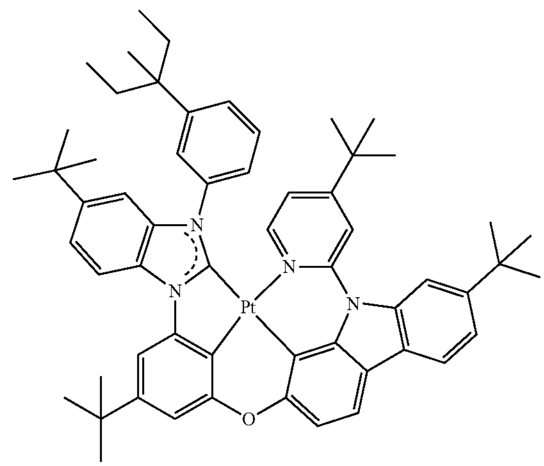
170
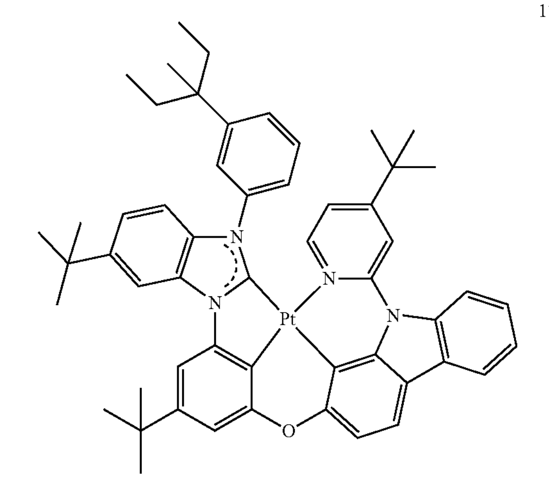
-continued
171
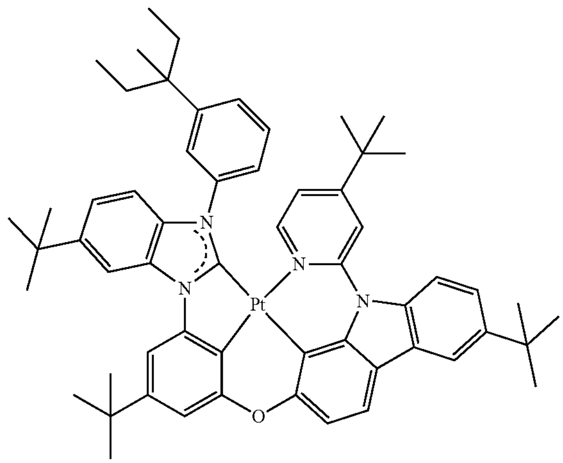
172
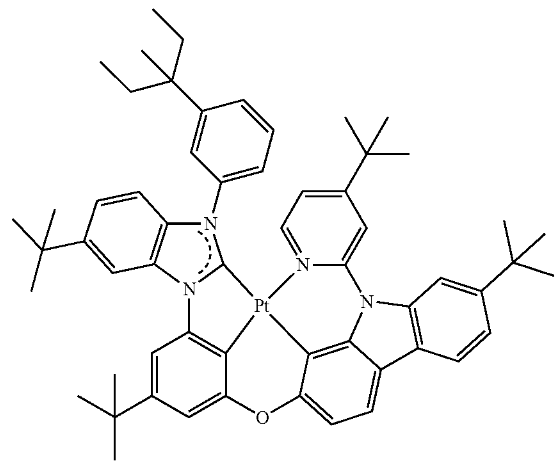
173
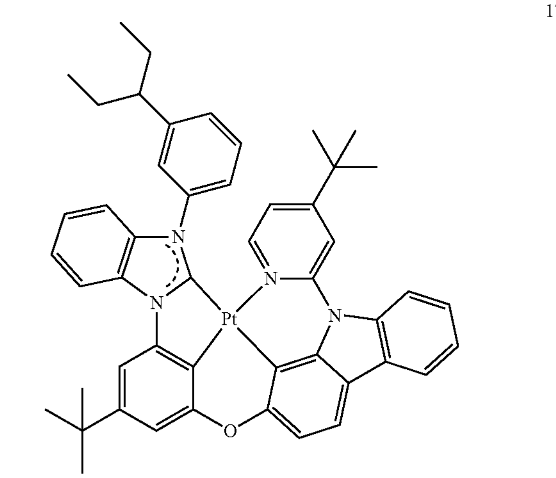

174
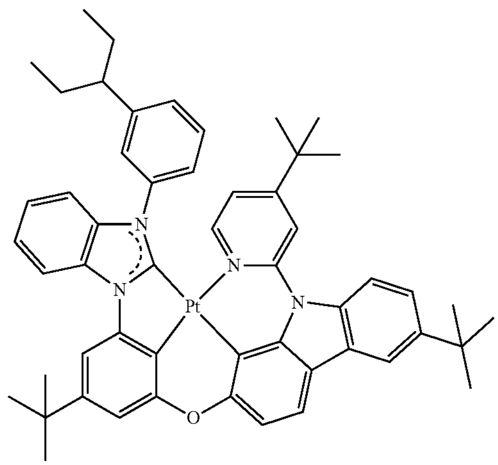
175
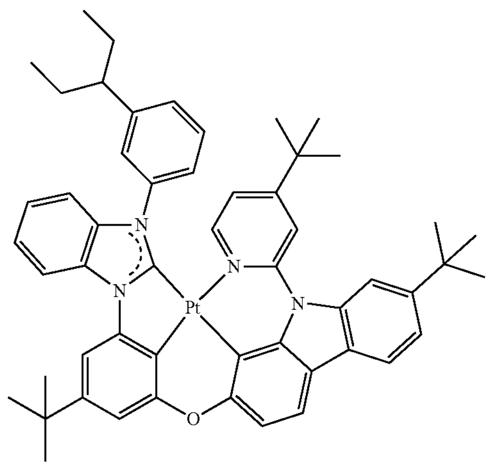
176
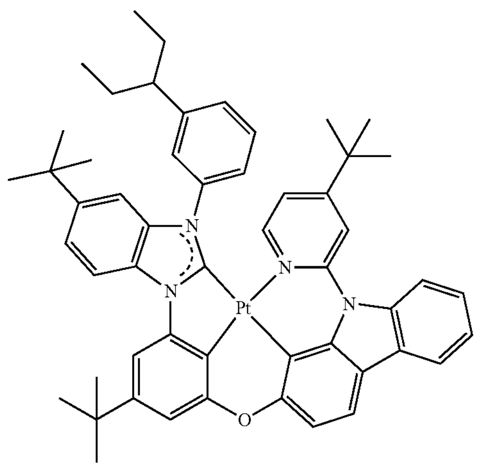
177
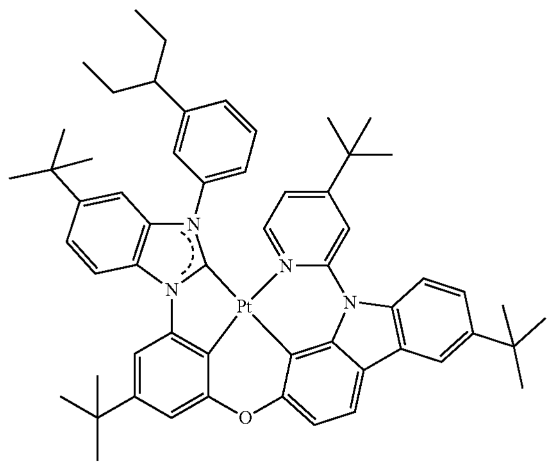
178
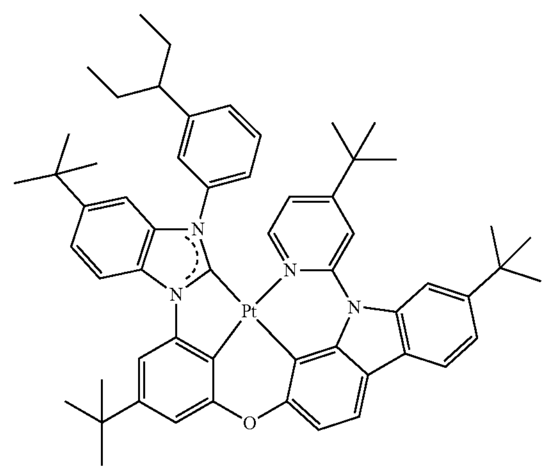
179
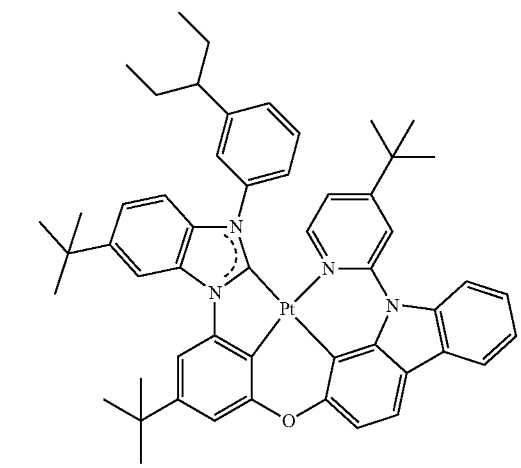

-continued
180
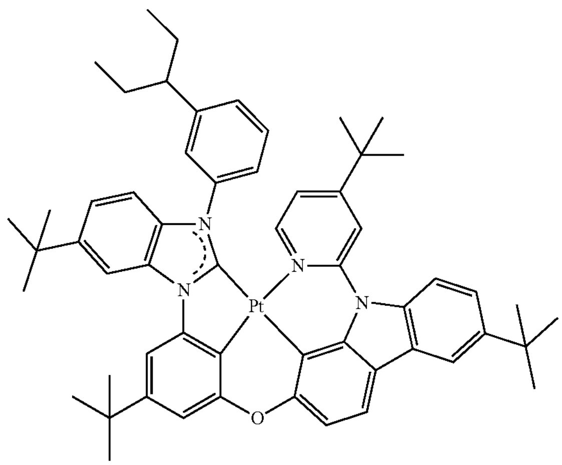
181
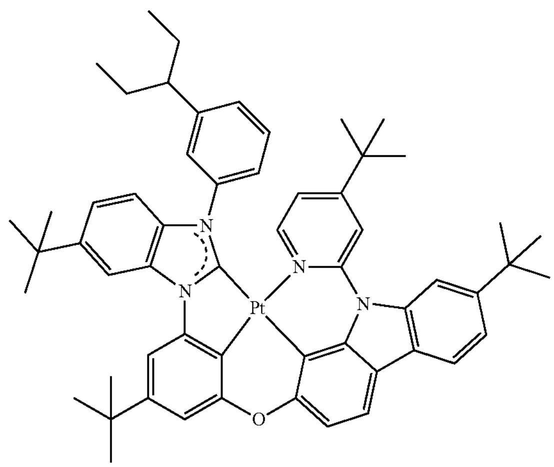
182
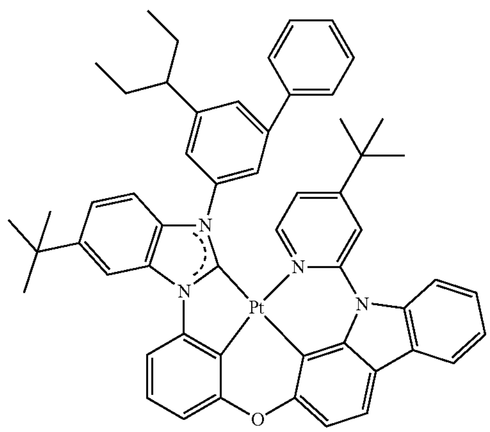
-continued
183
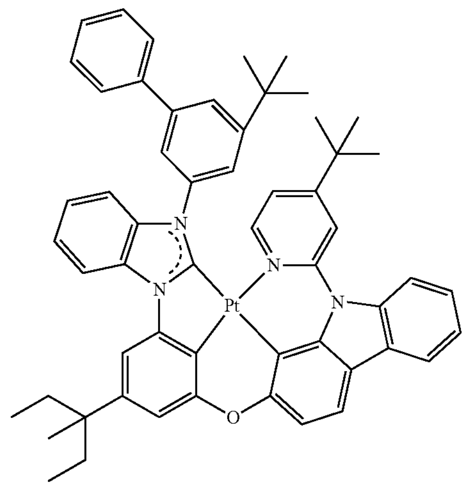
184
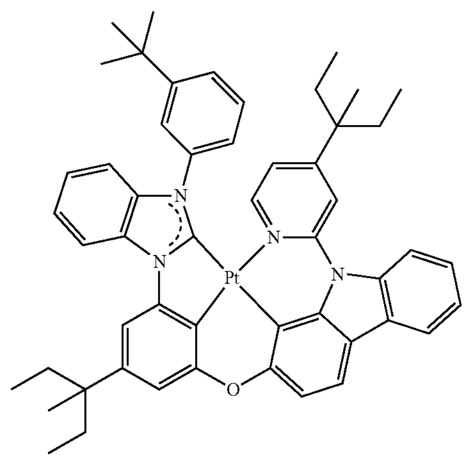
185
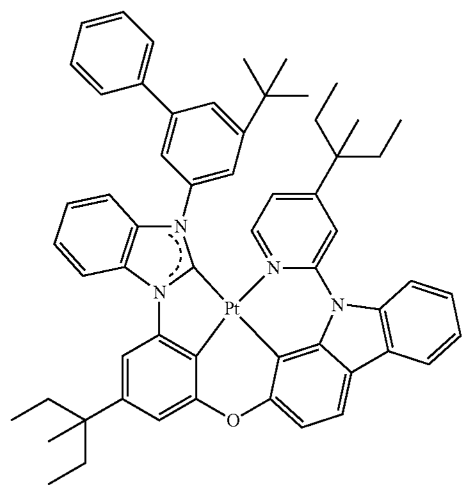

-continued
186
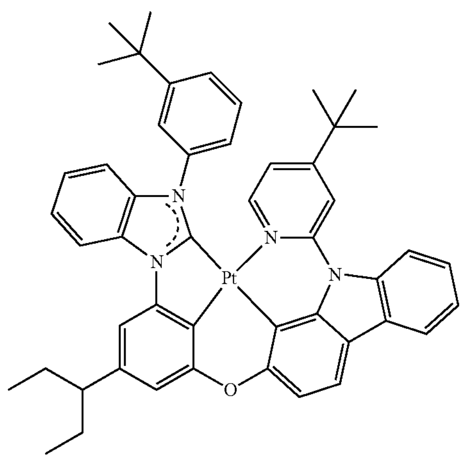
187
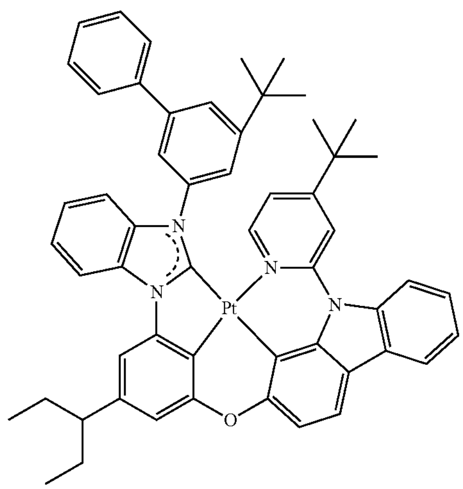
188
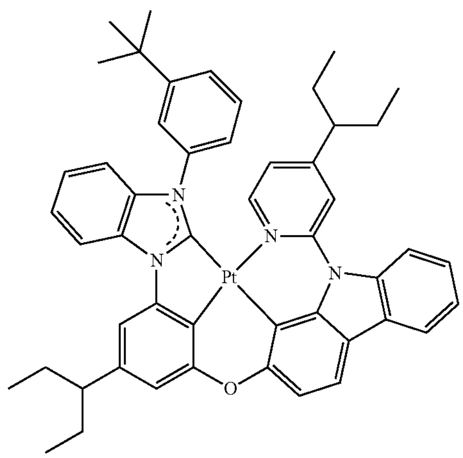
189
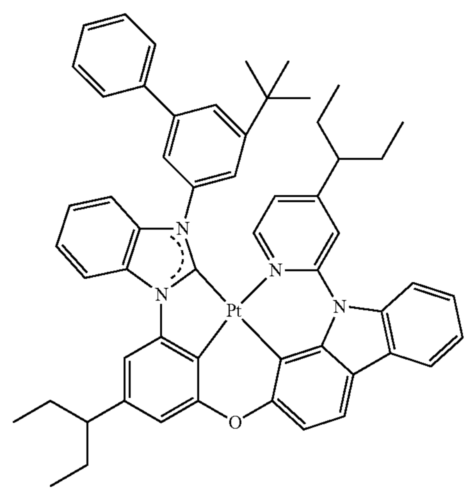
190
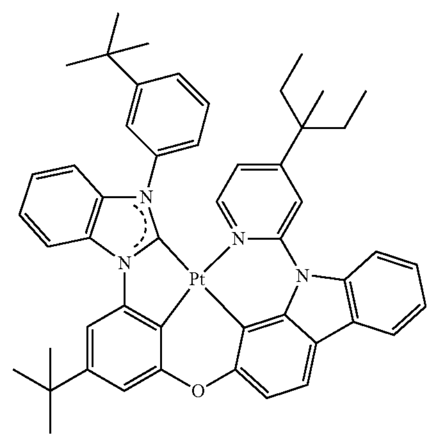
191
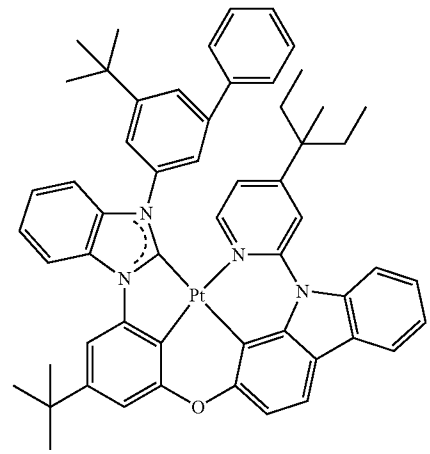

192
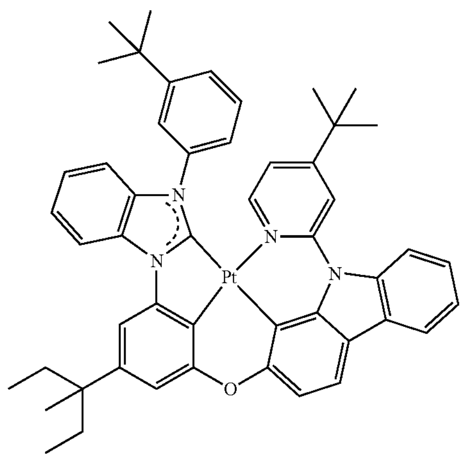
193
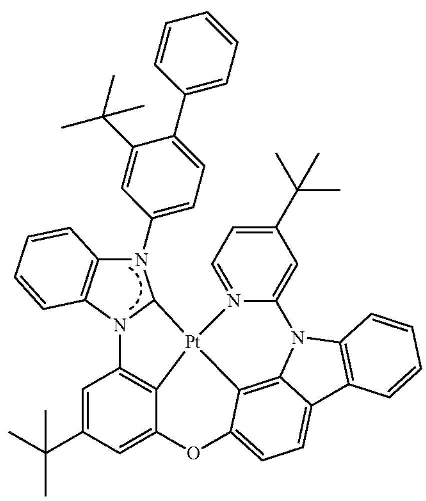
194
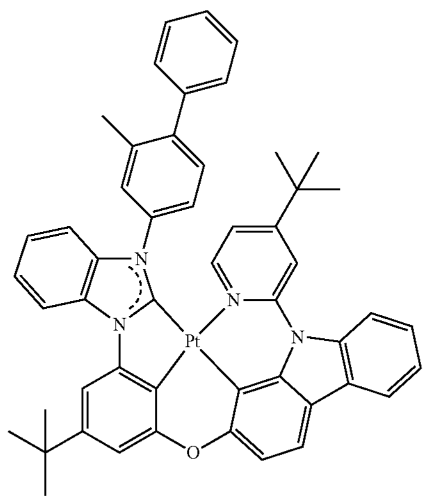
195
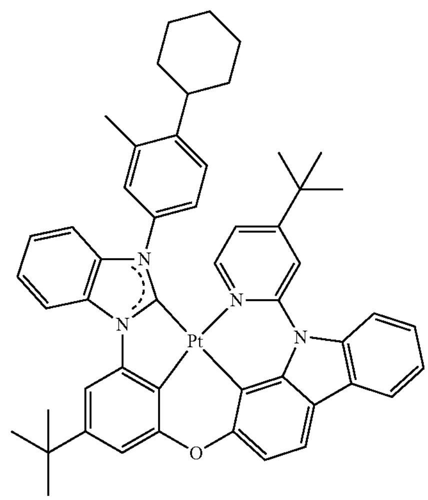
196
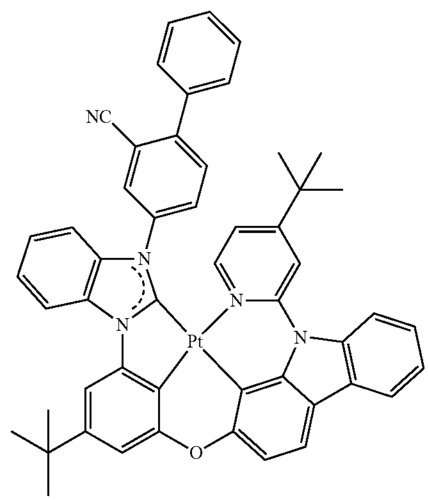
197
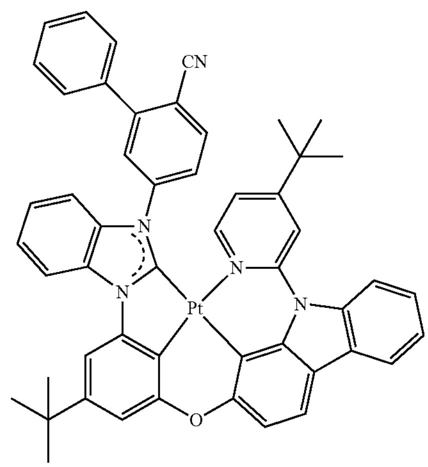

-continued
198
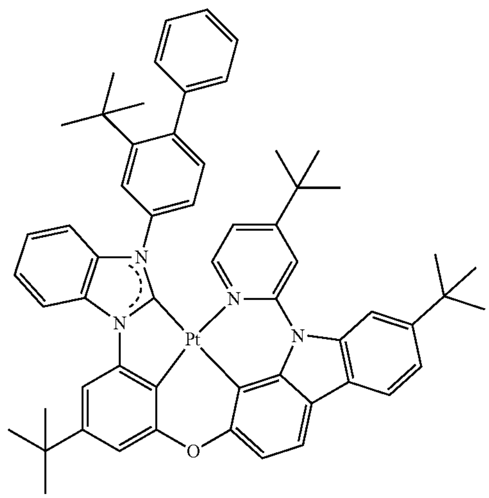
199
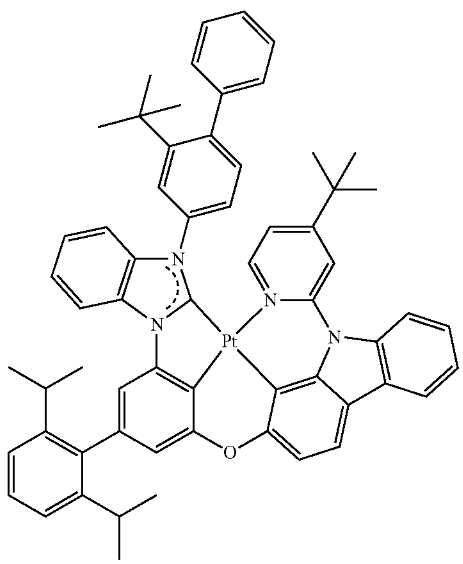
200
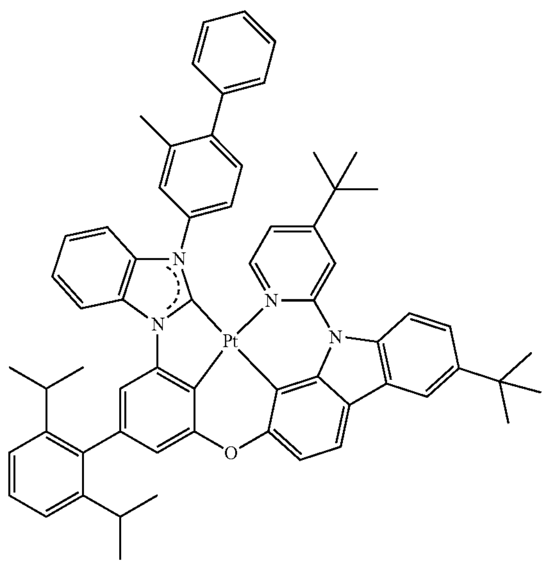
-continued
201
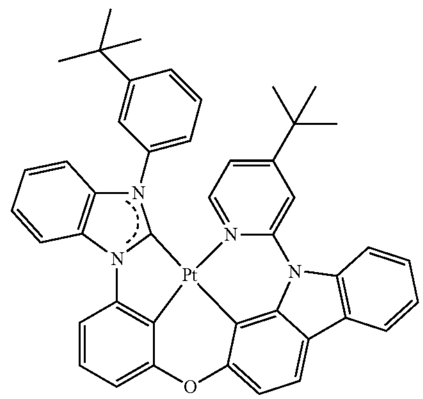
202
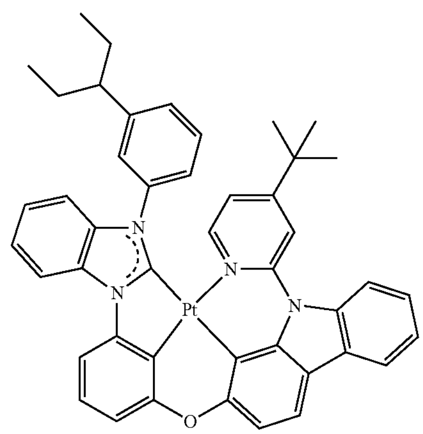
203
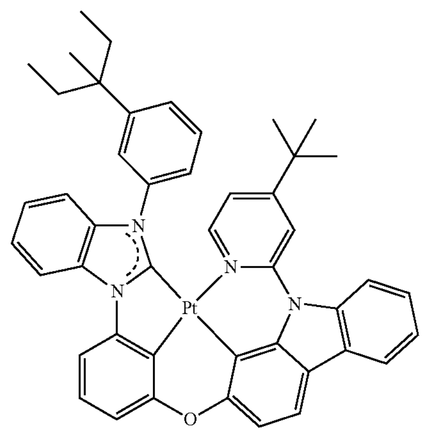

-continued
204
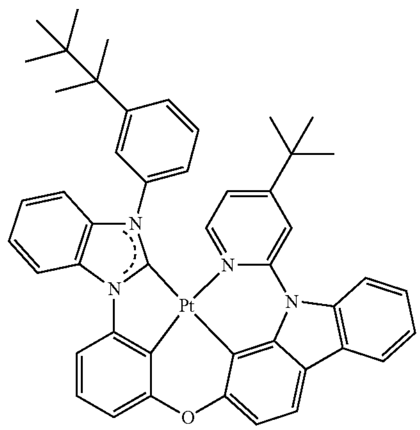
205
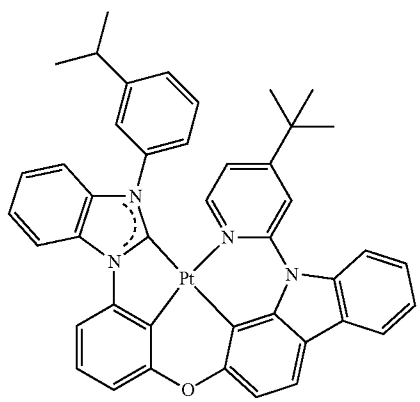
206
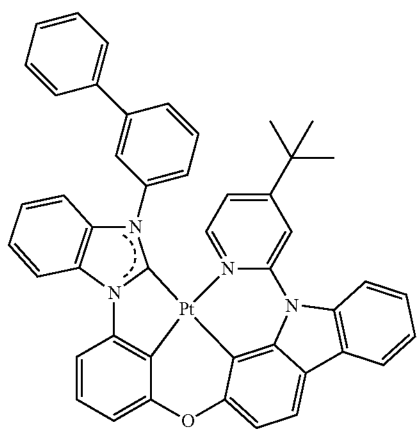
-continued
207
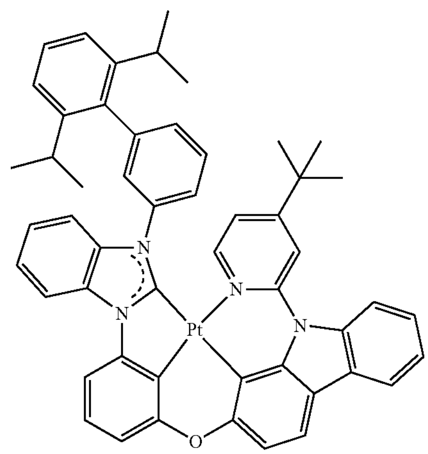
208
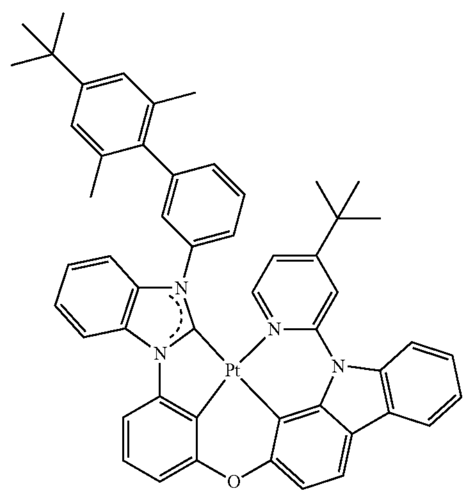
209
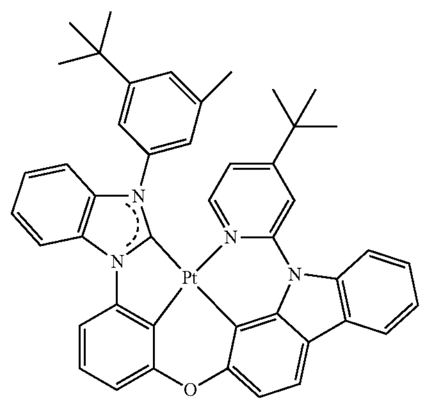

-continued
210
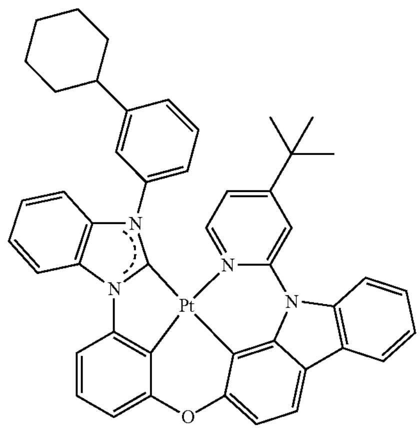
211
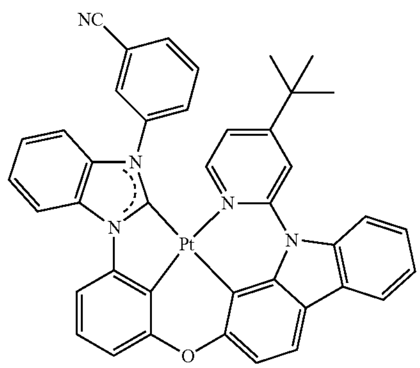
212
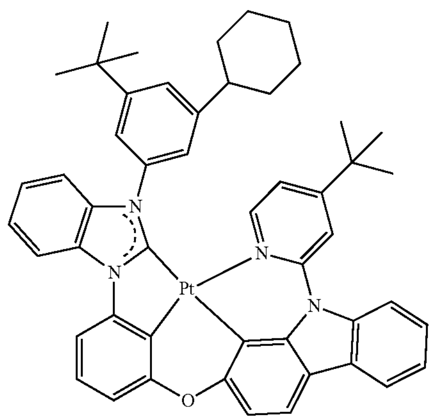
-continued
213
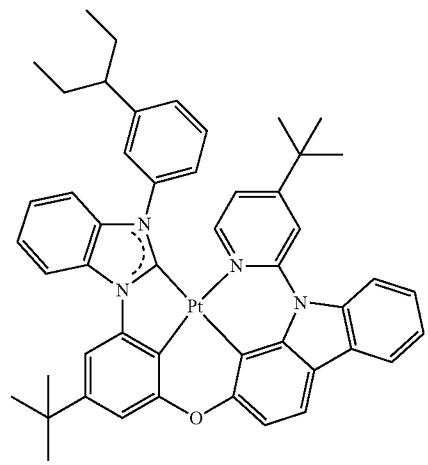
214
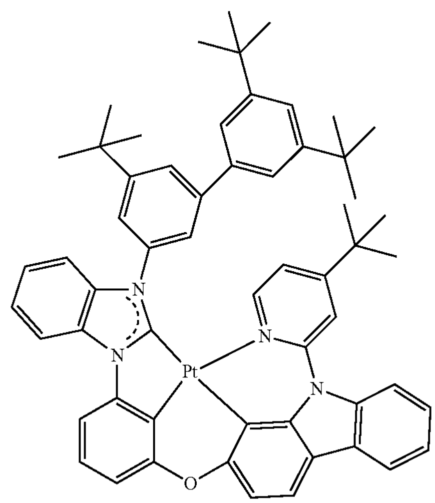
215
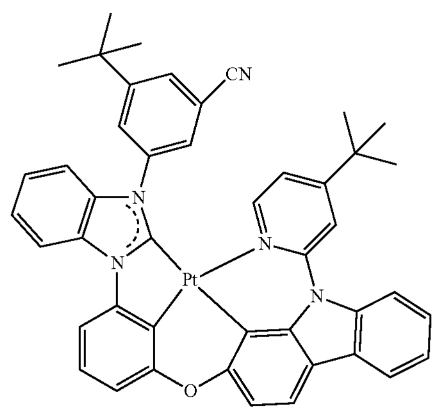

-continued
216
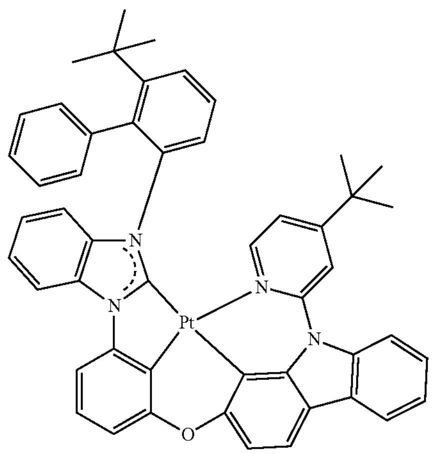
217
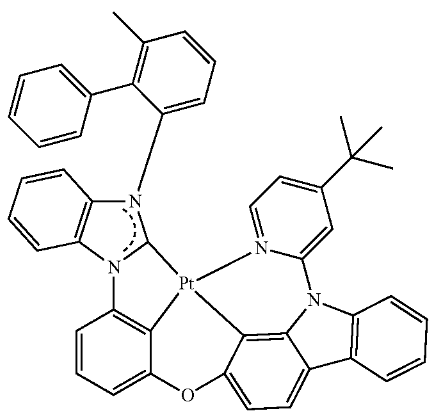
218
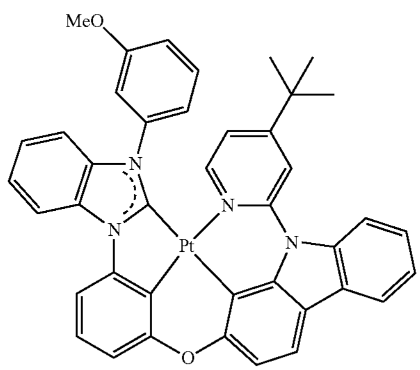
219
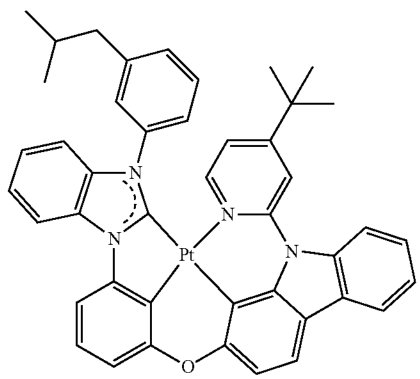
-continued
220
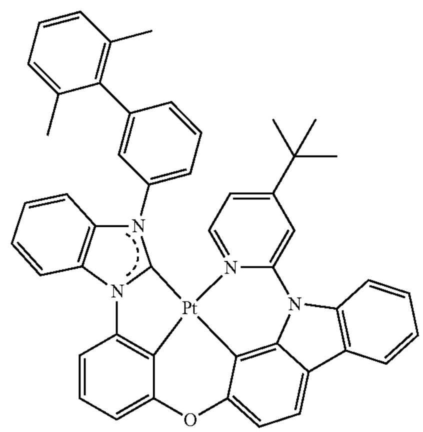
221
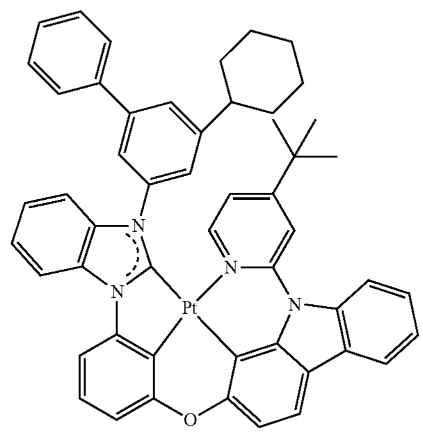
222
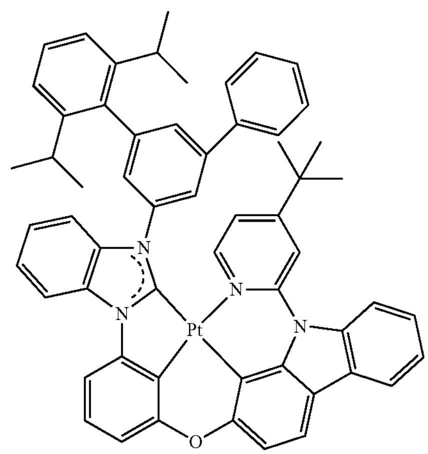

-continued
223
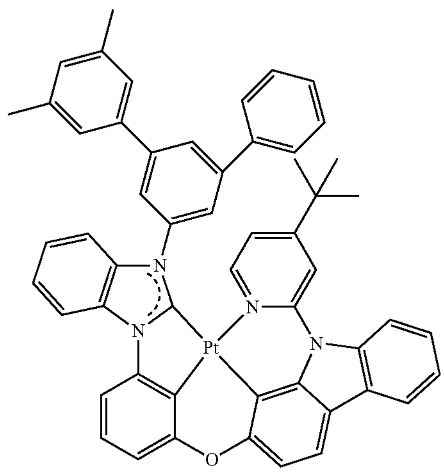
224
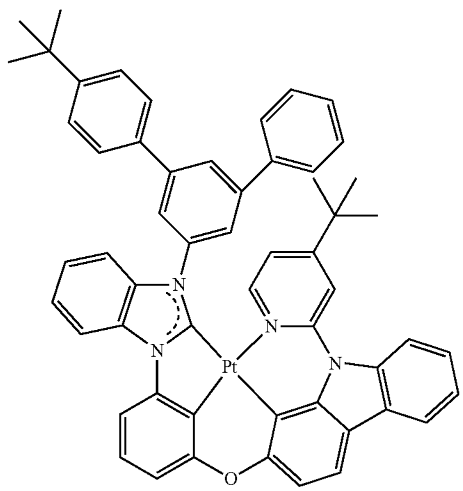
225
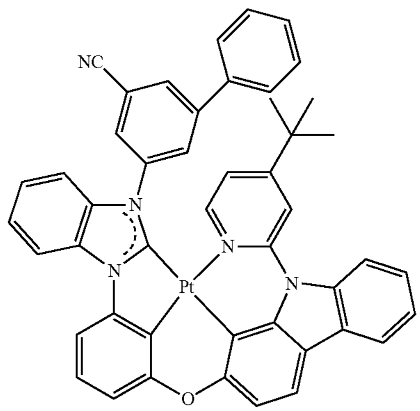
-continued
226
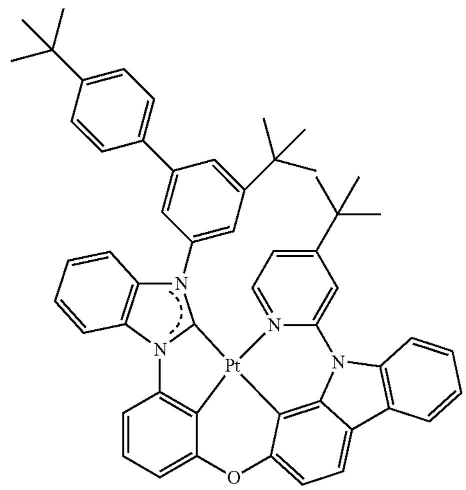
227
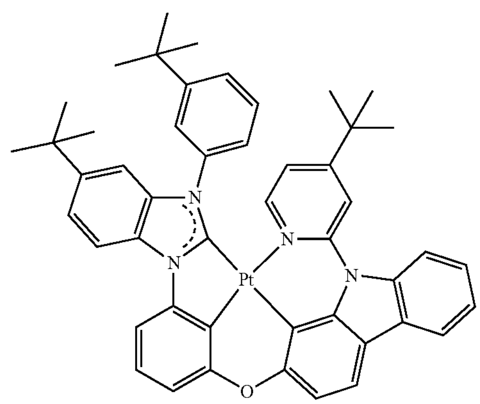
228
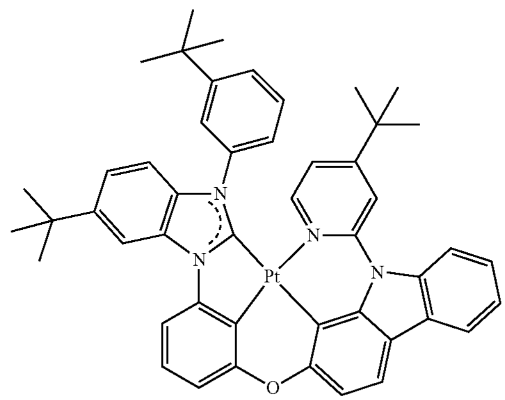

-continued
229
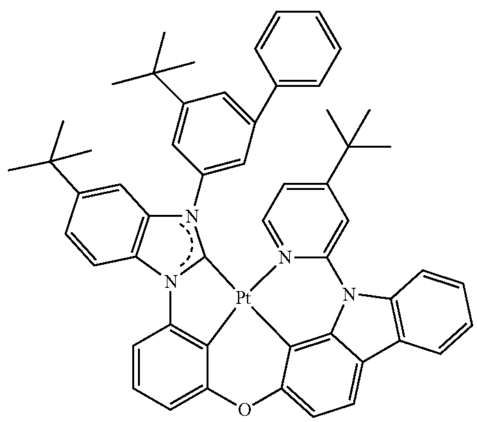
230
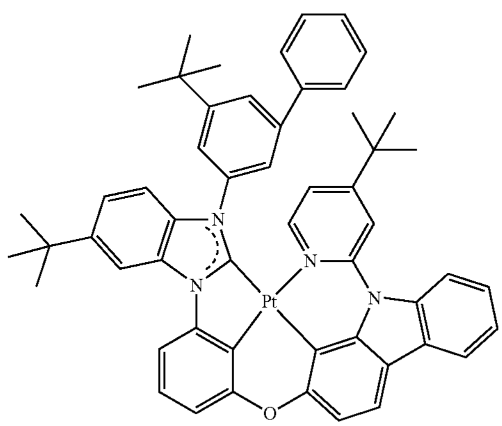
231
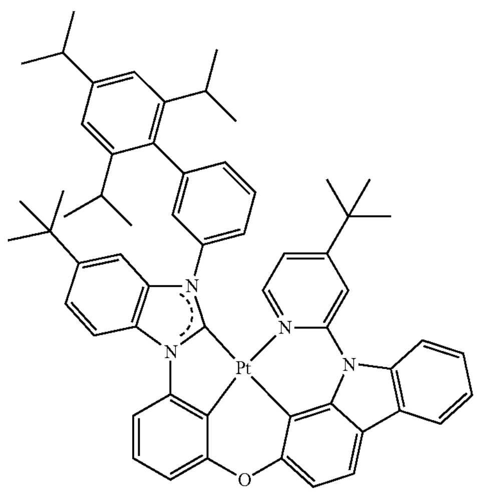
-continued
232
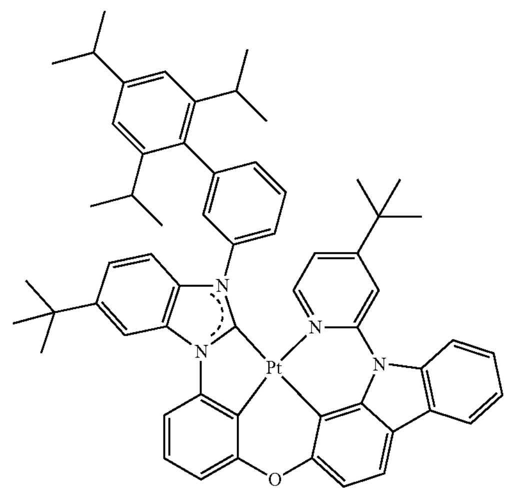
233
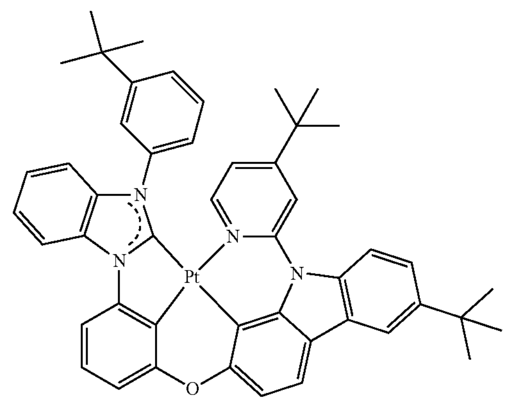
234
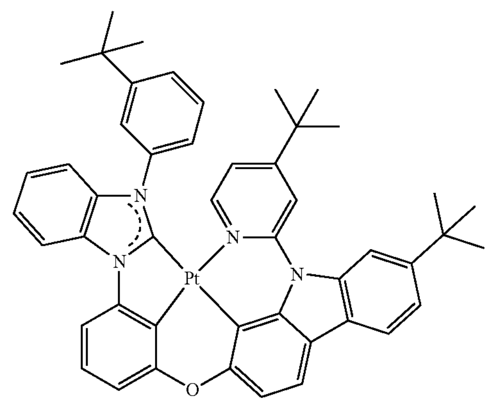

-continued
235
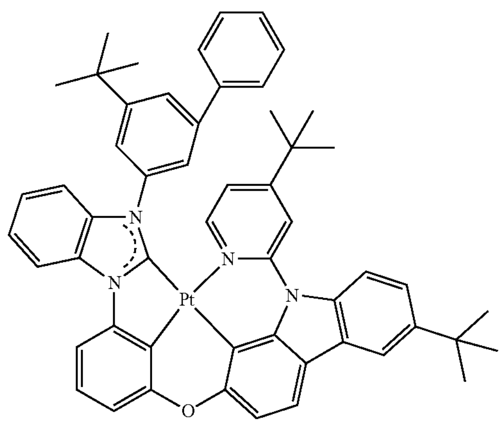
236
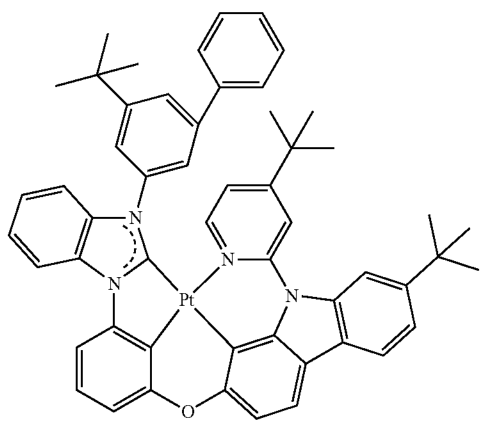
237
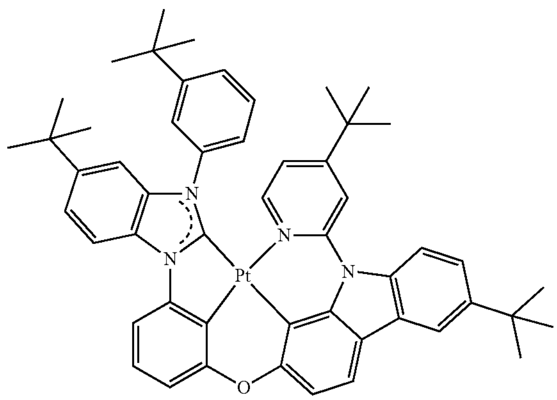
-continued
238
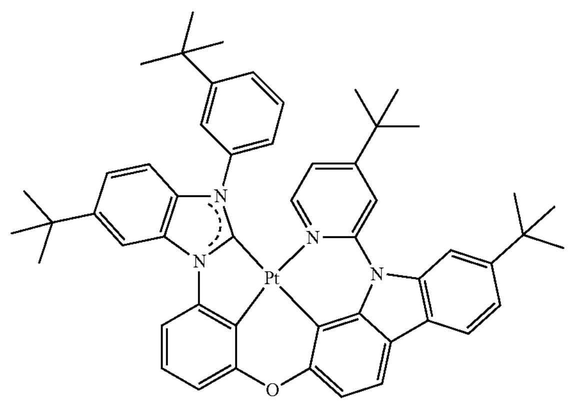
239
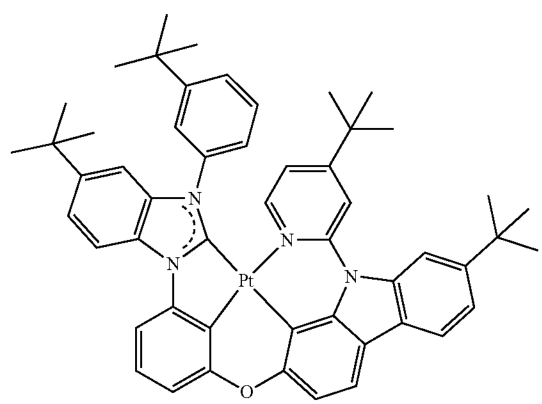
240
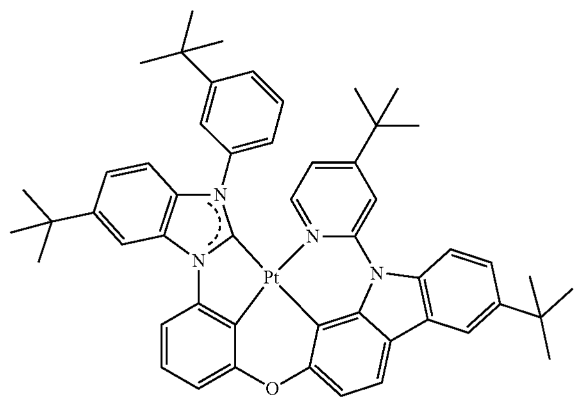

-continued
241
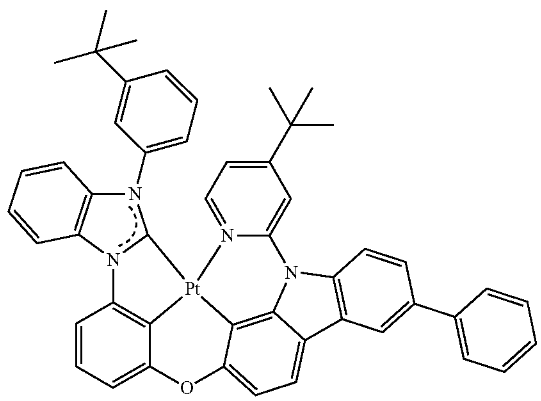
242
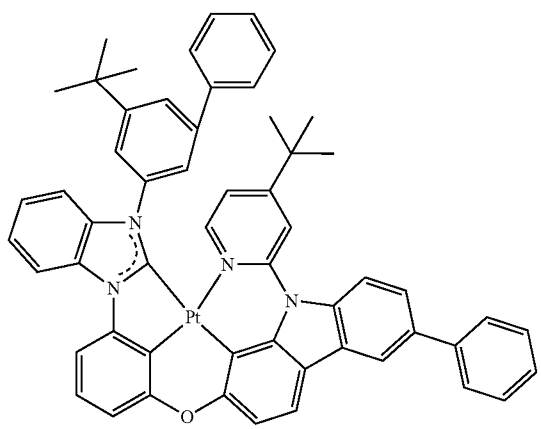
243
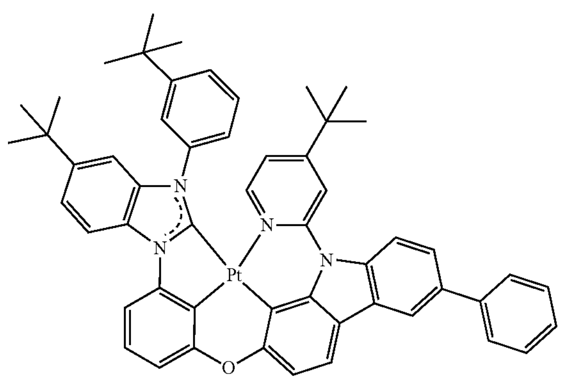
244
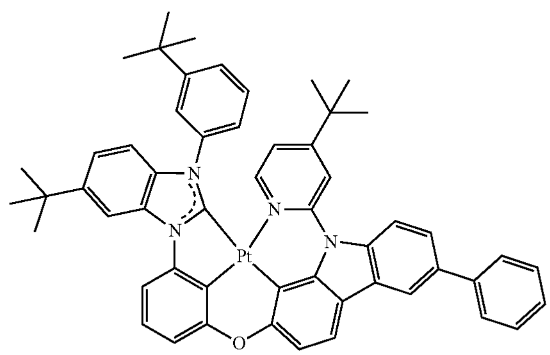
245
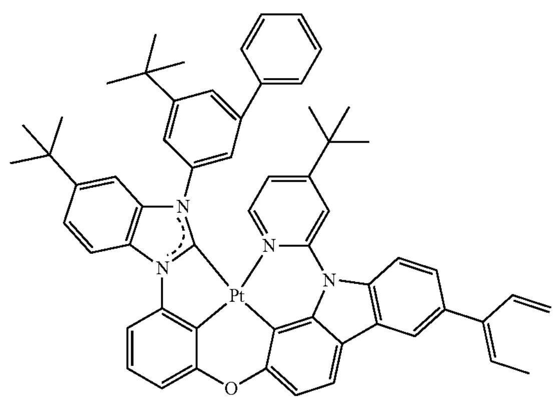
246
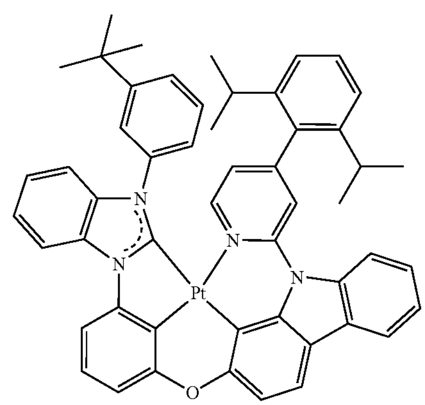
247
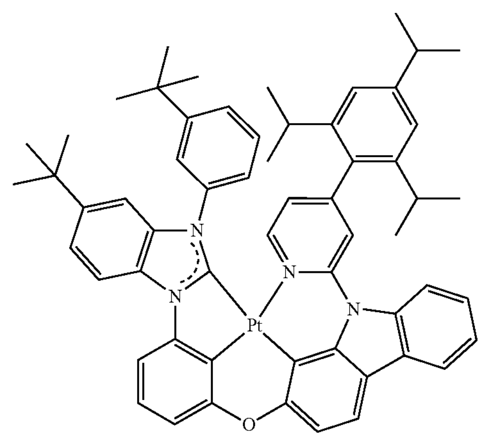

-continued
248
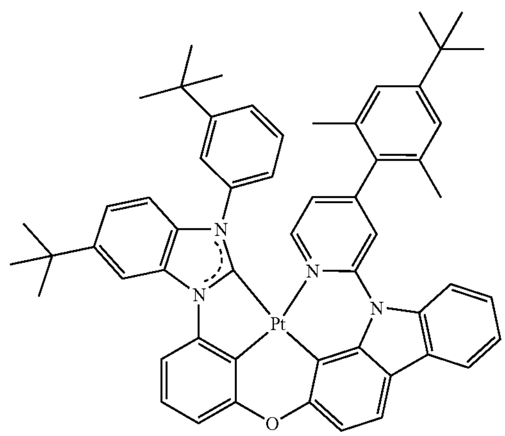
249
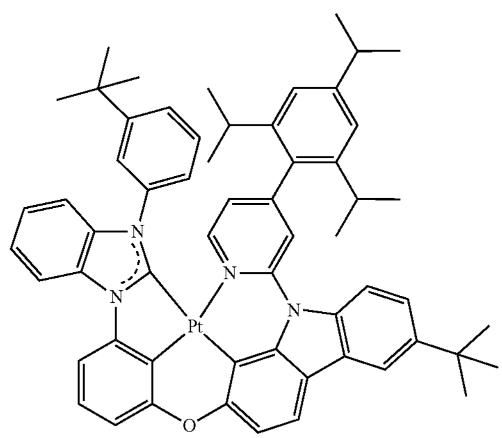
250
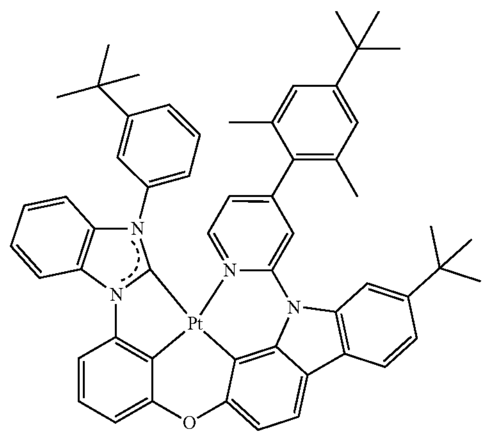
-continued
251
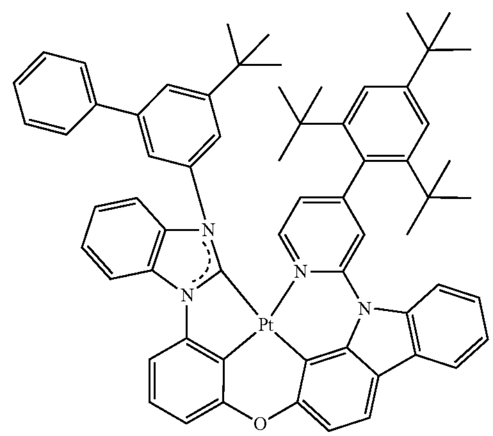
252
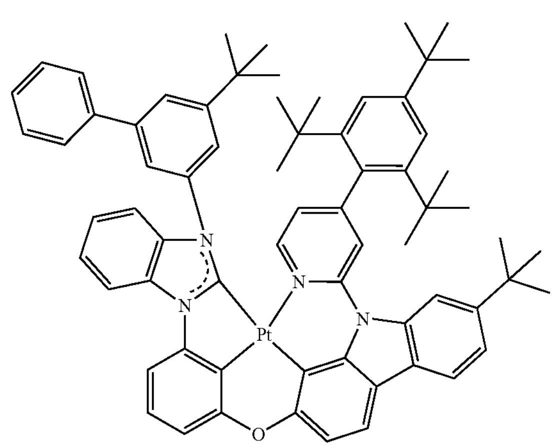
253
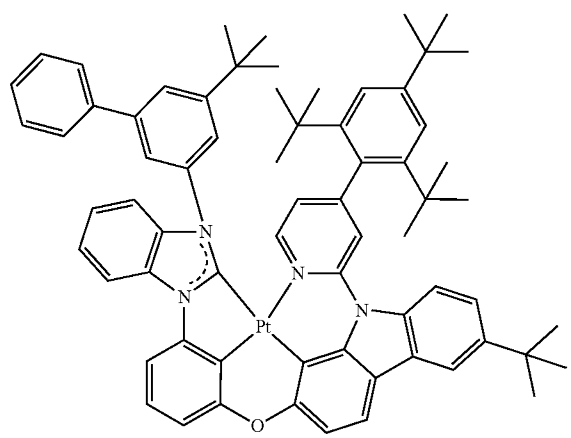

254
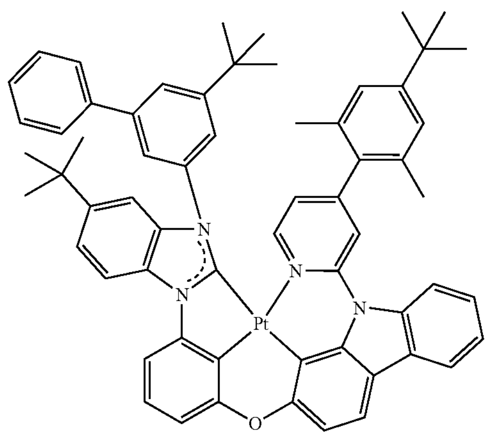
255
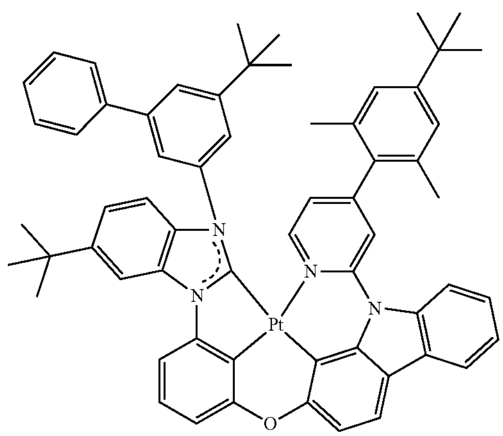
256
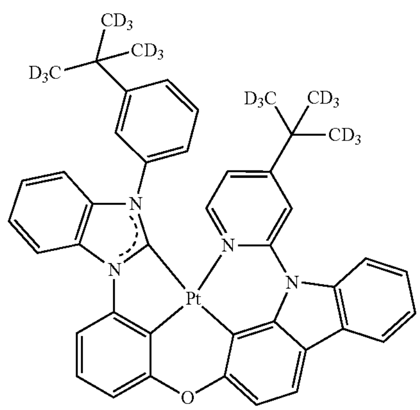
257
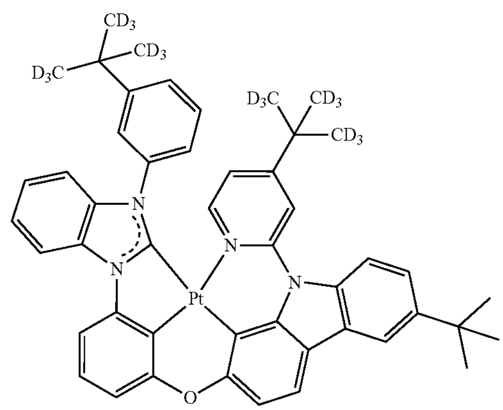
258
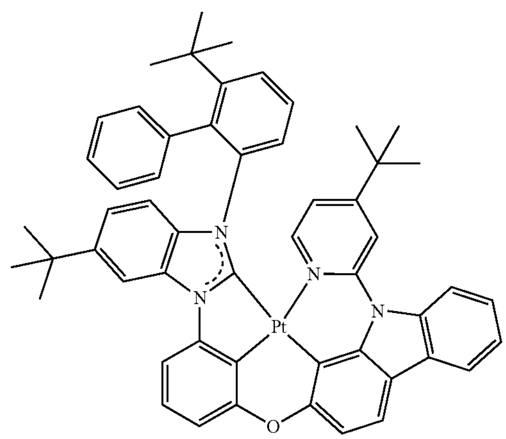
259
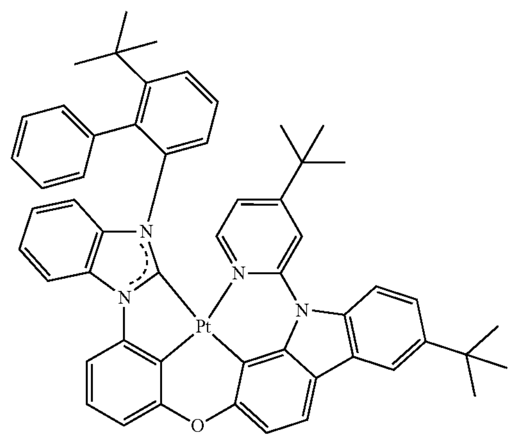

-continued
260
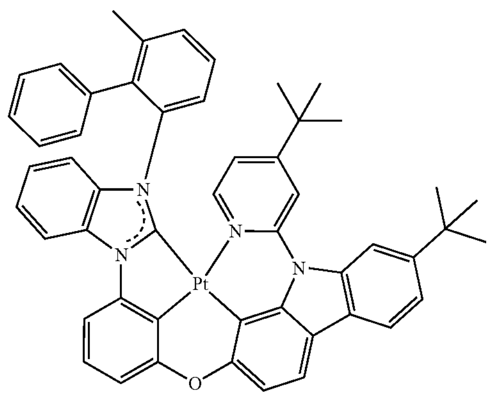
261
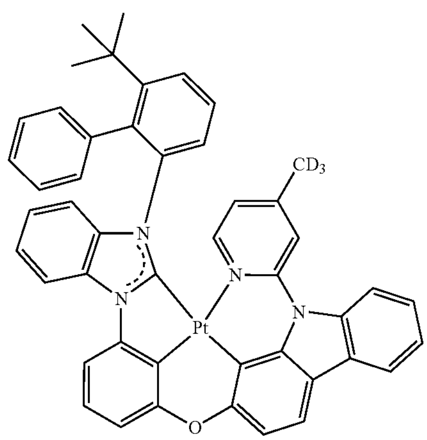
262
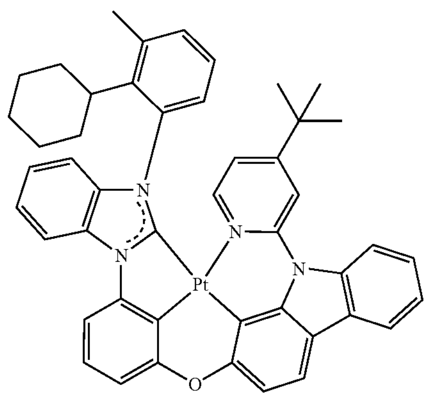
263
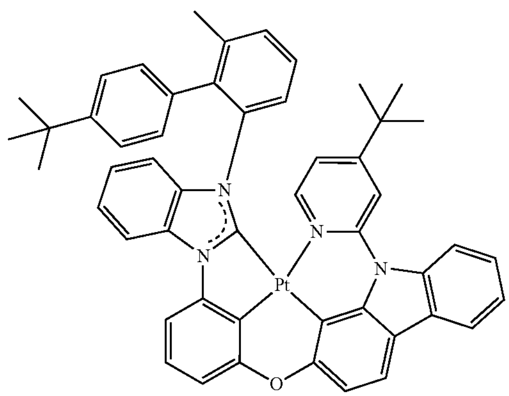
-continued
264
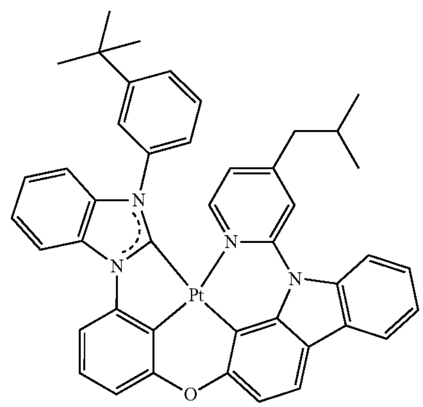
265
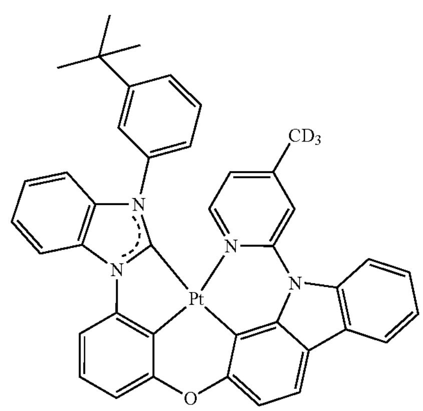
266
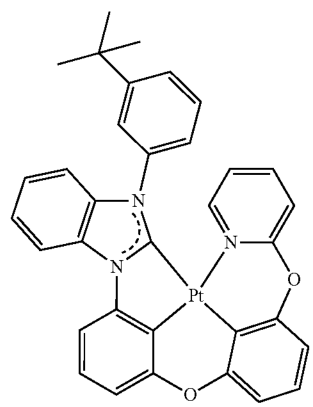
267
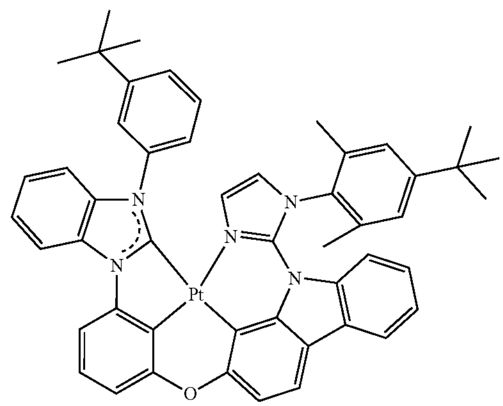

-continued
268
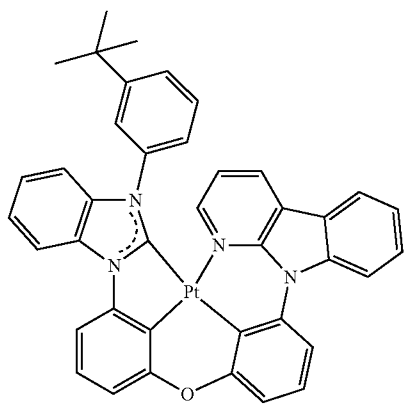
269
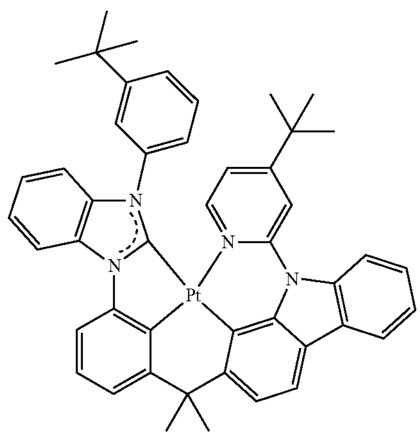
270
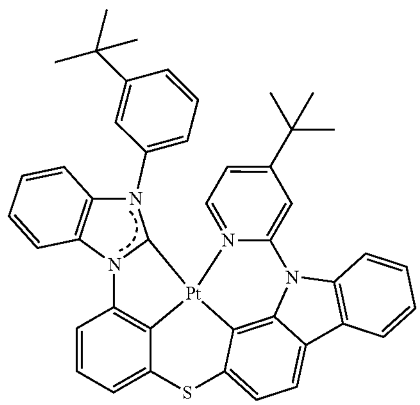
-continued
271
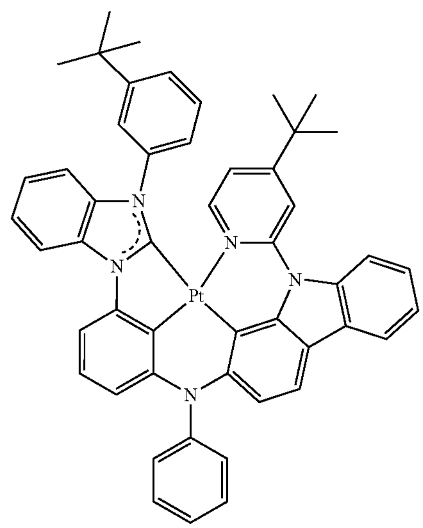
272
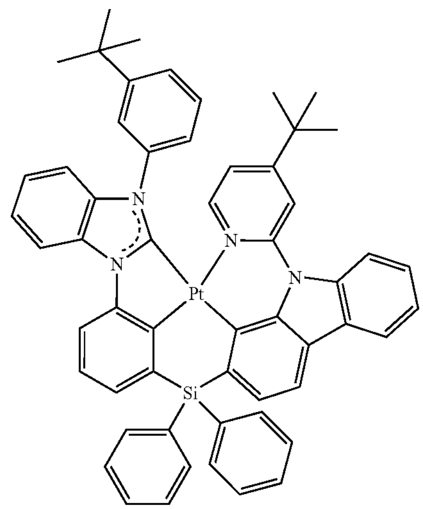
273
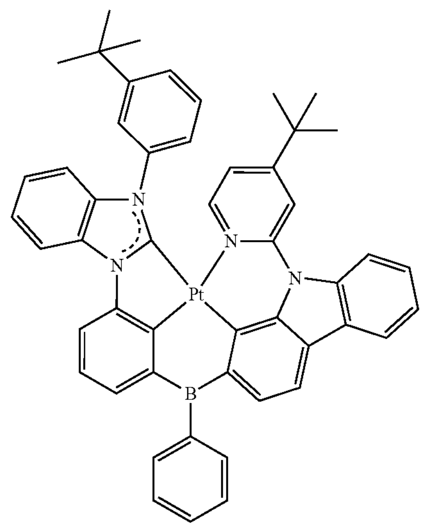

-continued
274
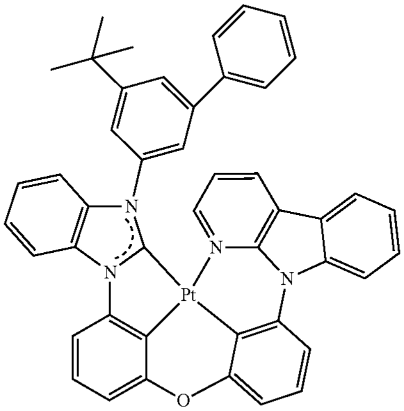
275
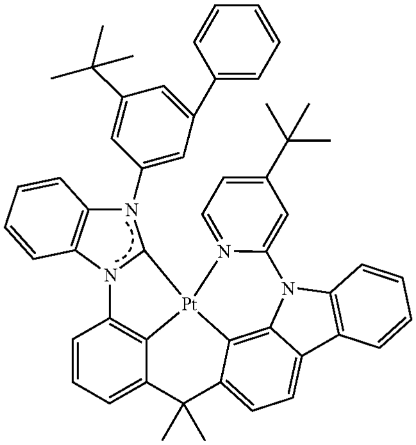
276
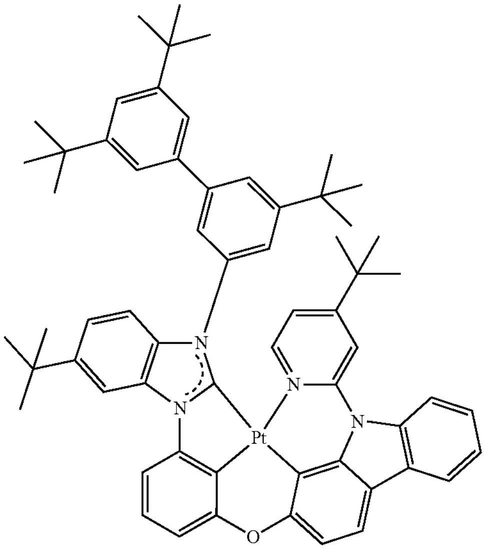
-continued
277
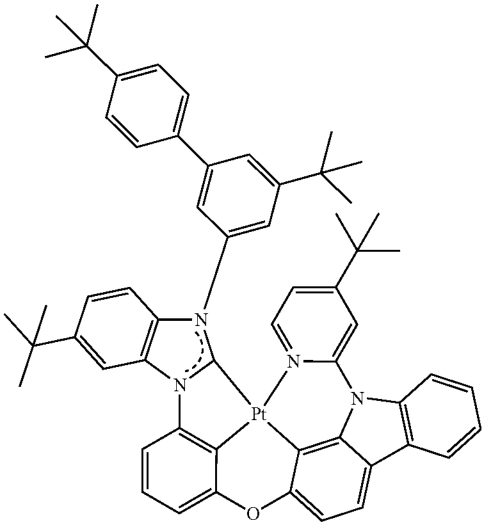
278
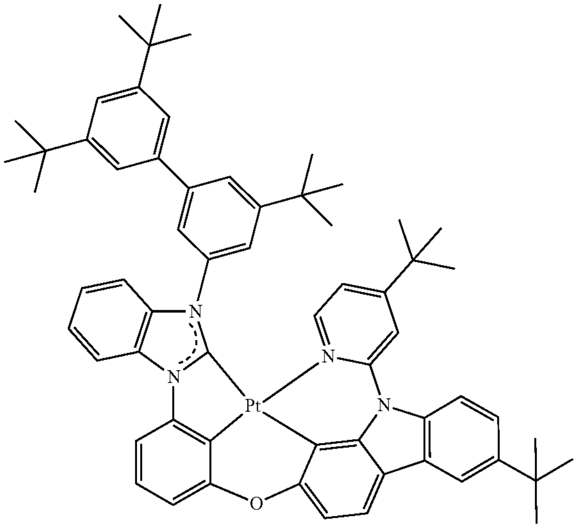
279
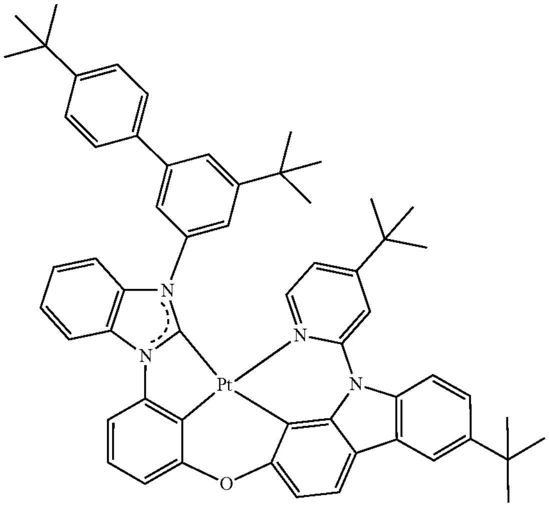

-continued
280
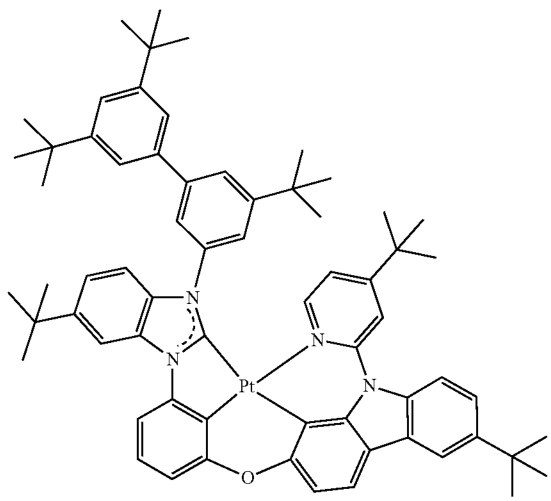
281
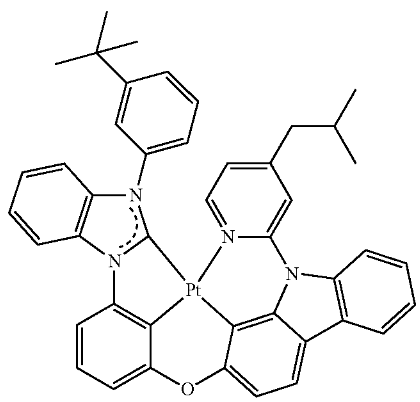
282
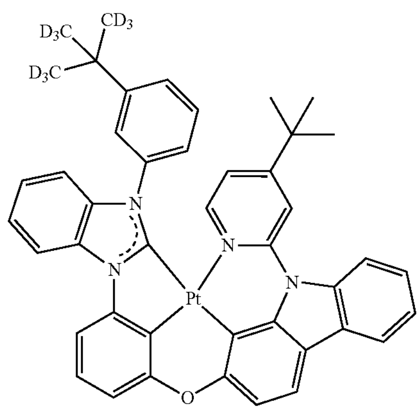
-continued
283
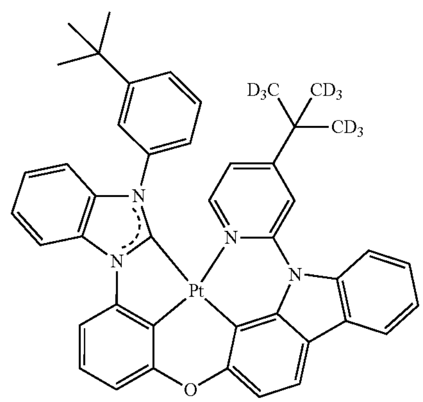
284
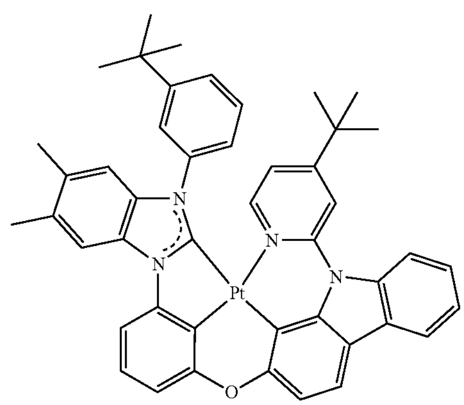
285
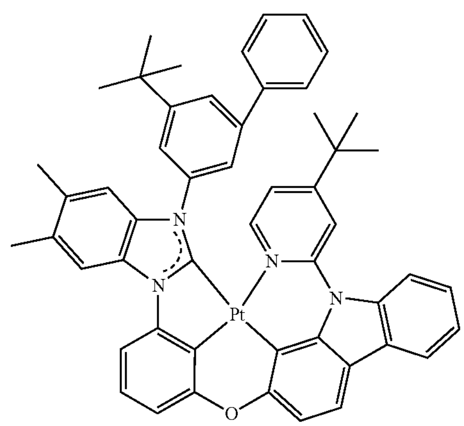
286
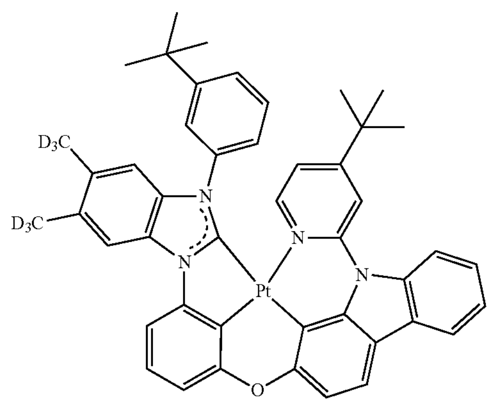

-continued
287
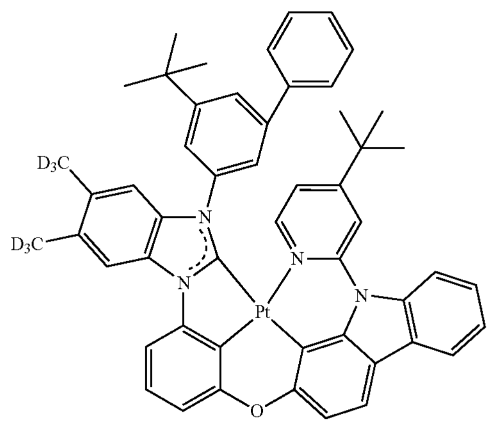
288
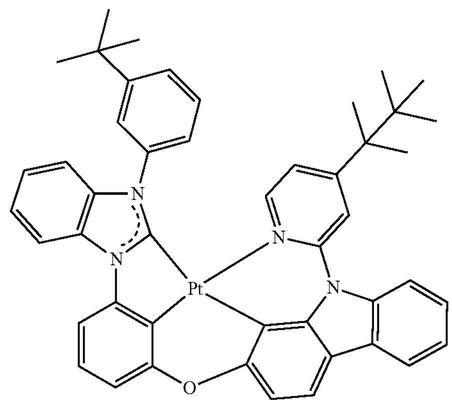
289
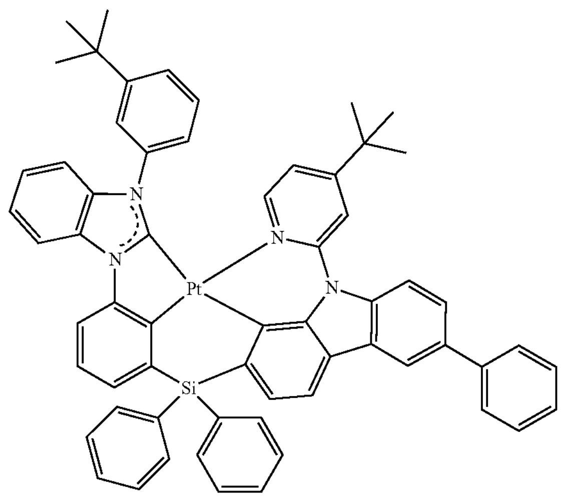
290
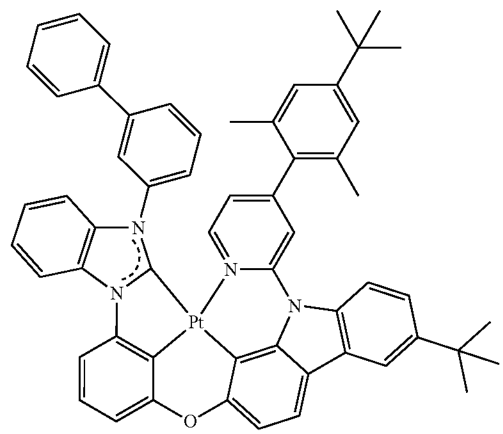
291
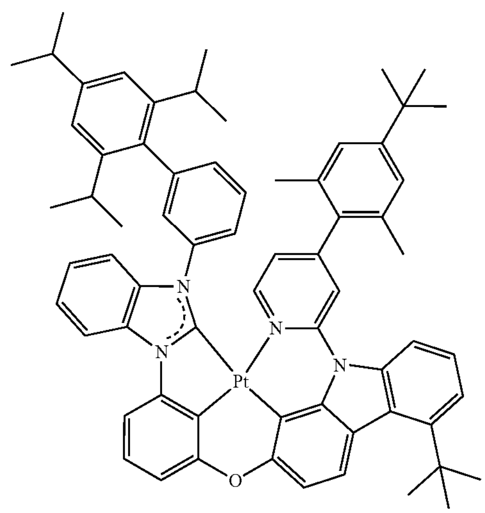
292
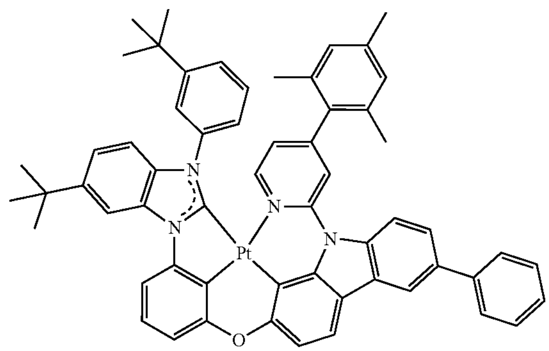

-continued
293
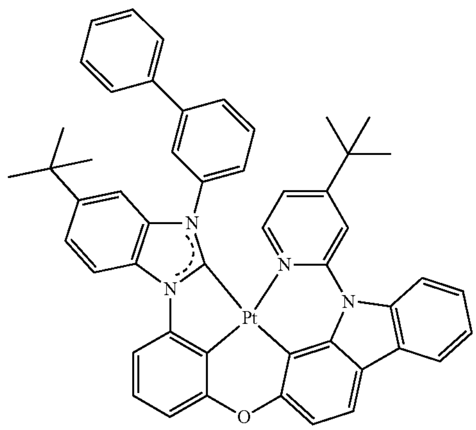
294
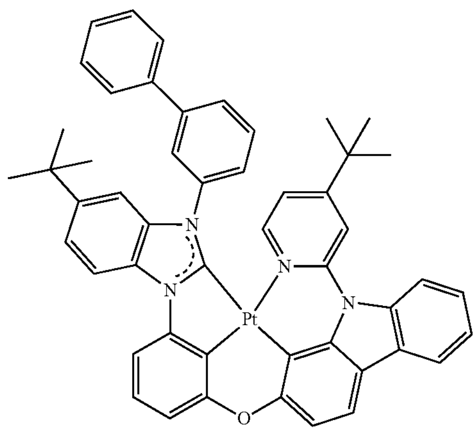
295
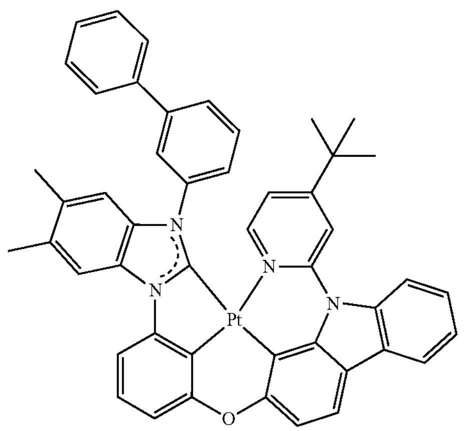
-continued
296
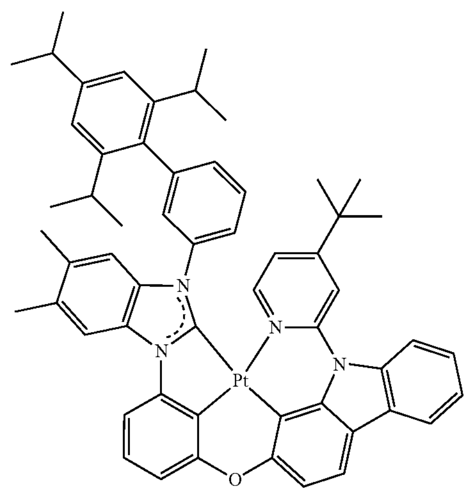
297
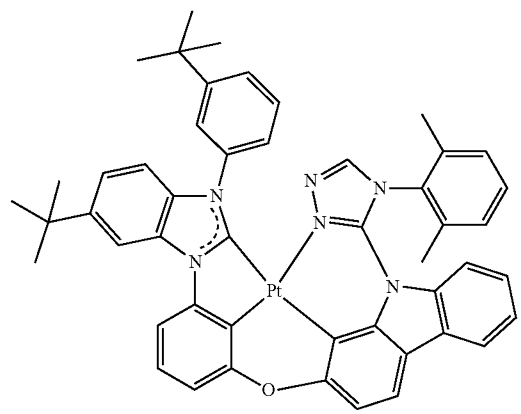
298
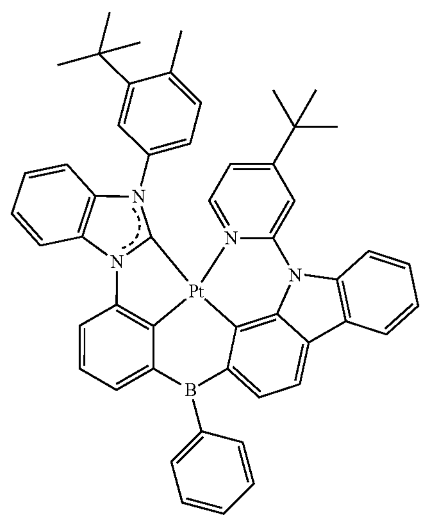

-continued
299
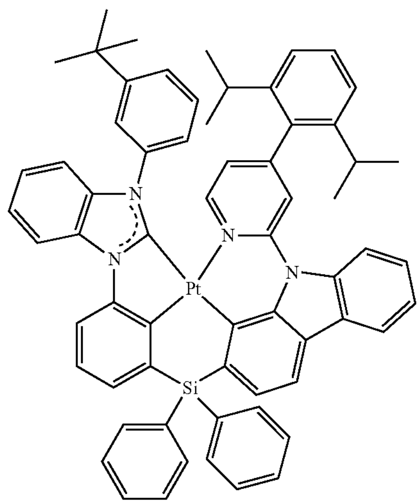
300
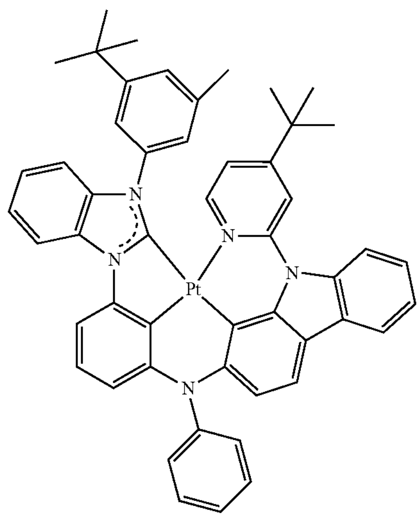
301
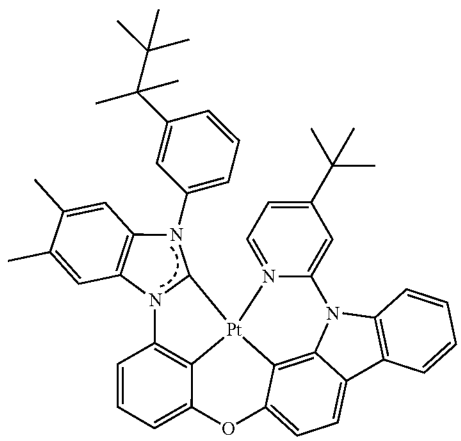
-continued
302
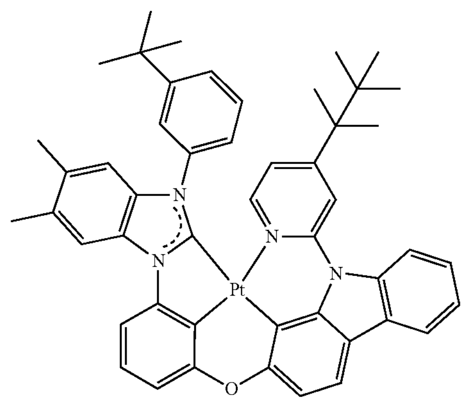
303
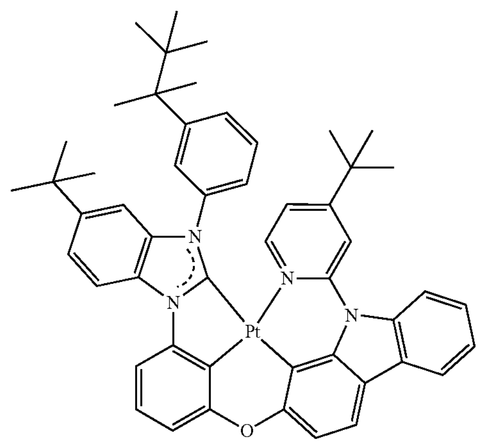
304
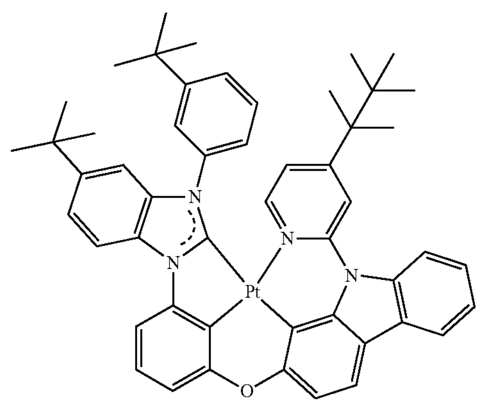

-continued
305
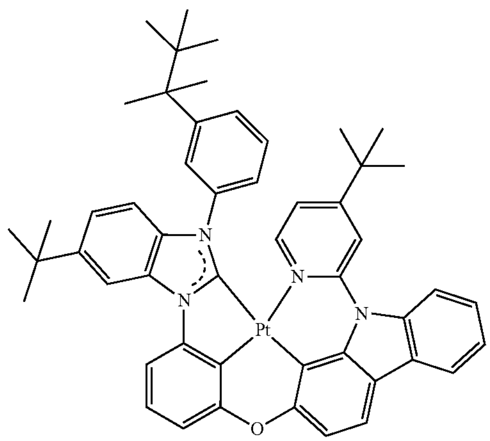
306
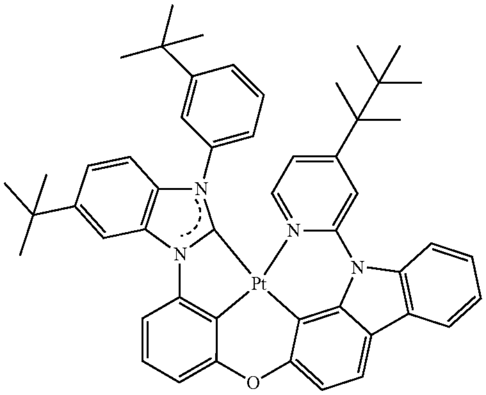
307
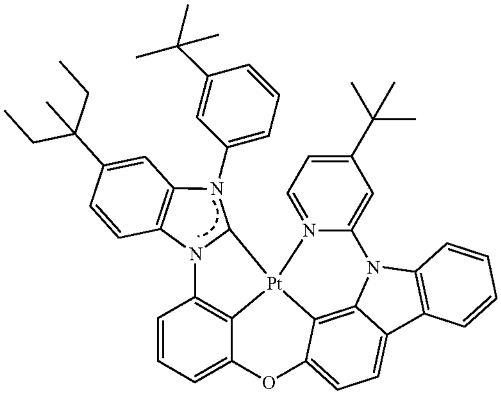
-continued
308
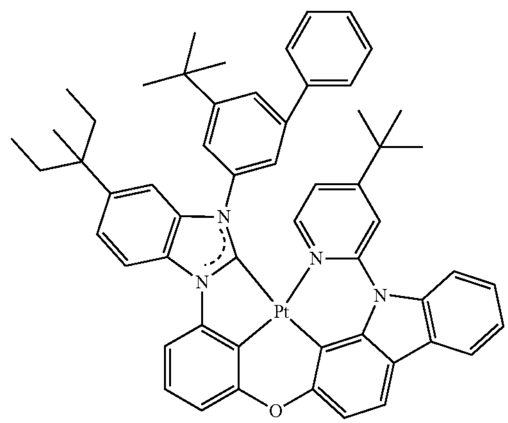
309
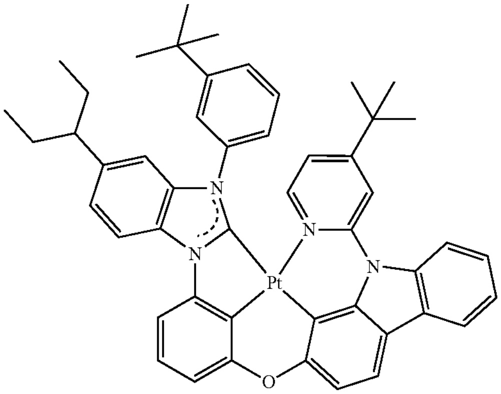
310
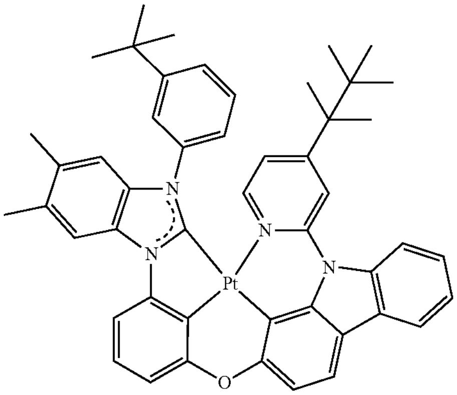

-continued
311
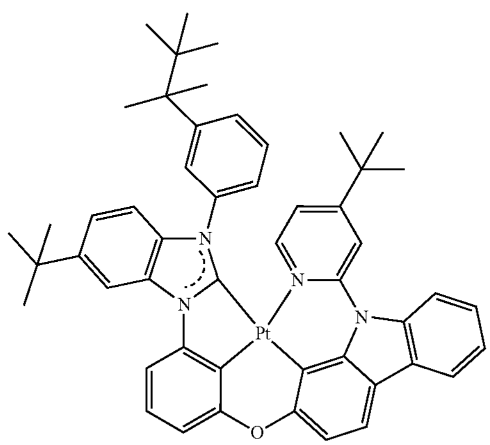
312
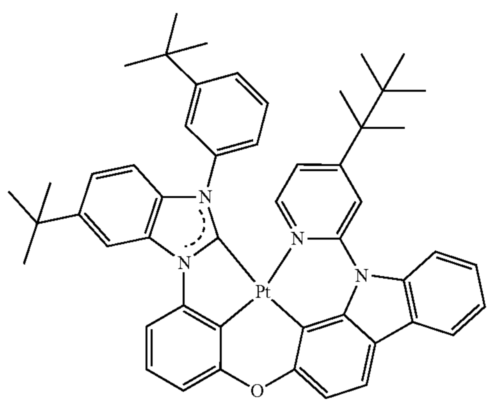
313
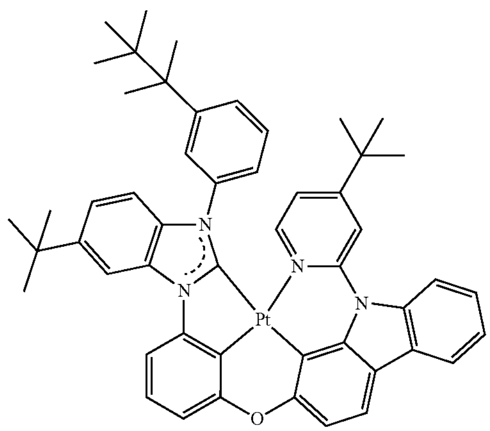
-continued
314
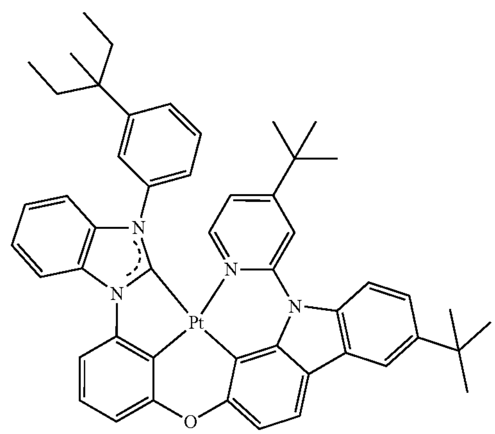
315
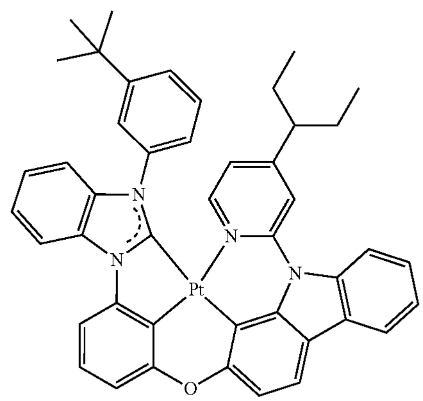
316
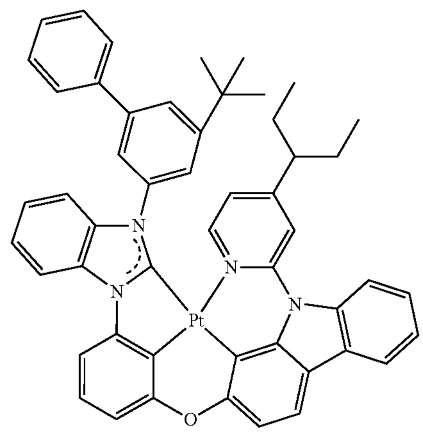
317
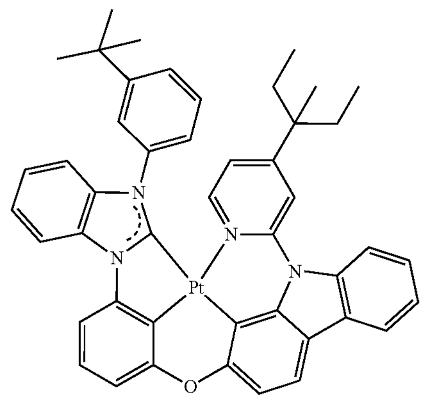

-continued
318
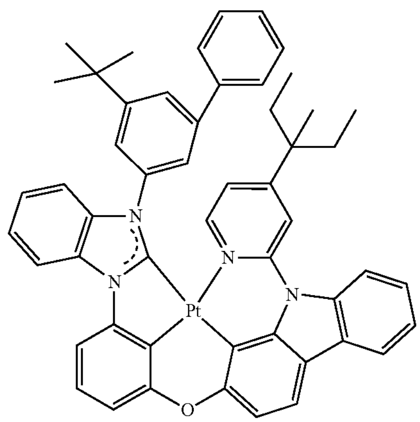
319
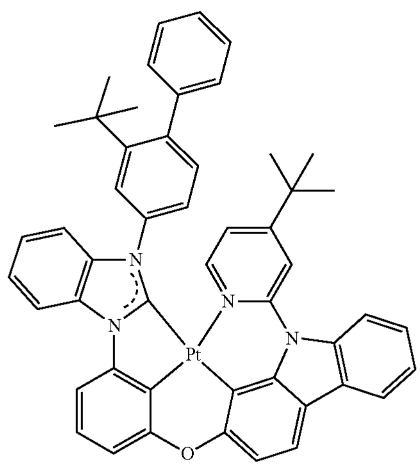
320
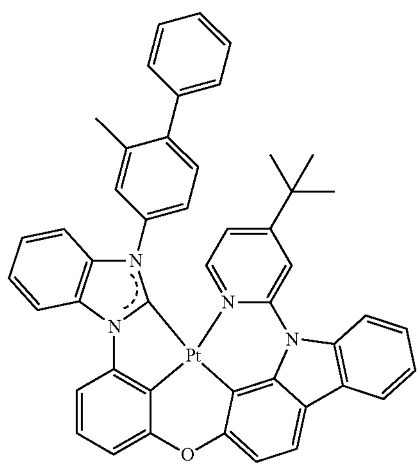
-continued
321
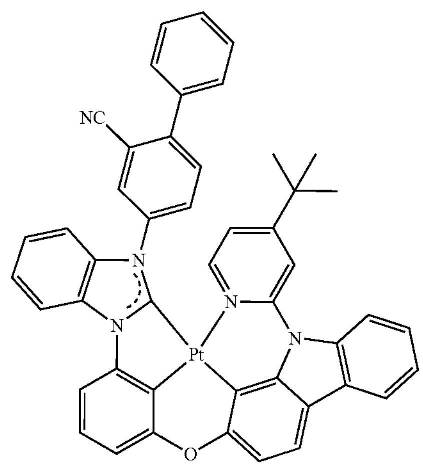
322
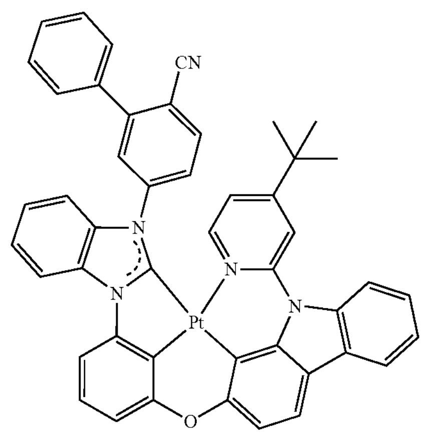
323
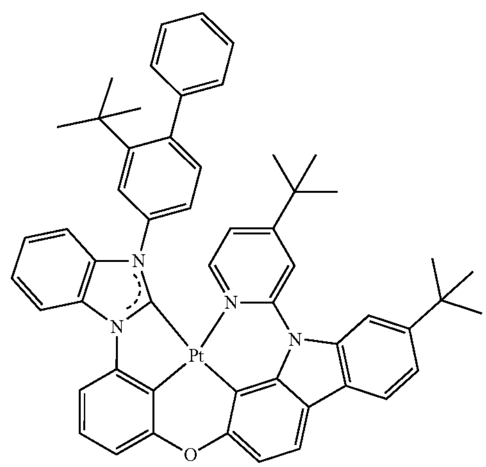

-continued
324
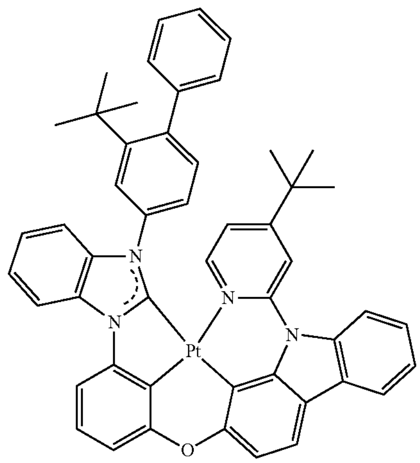
325
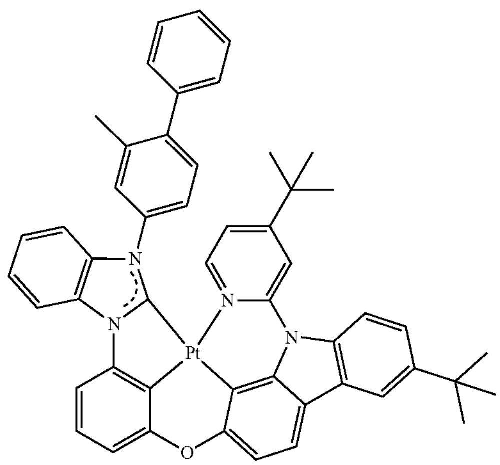
Group VIII
1
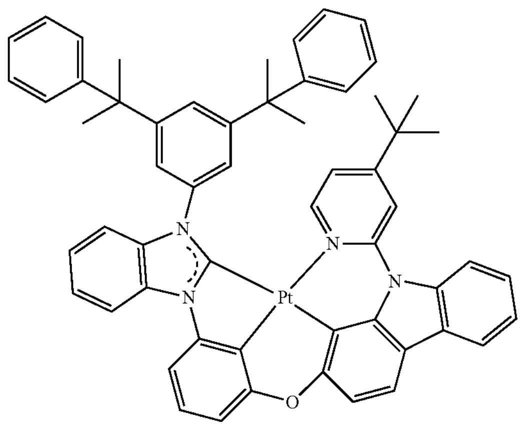
-continued
2
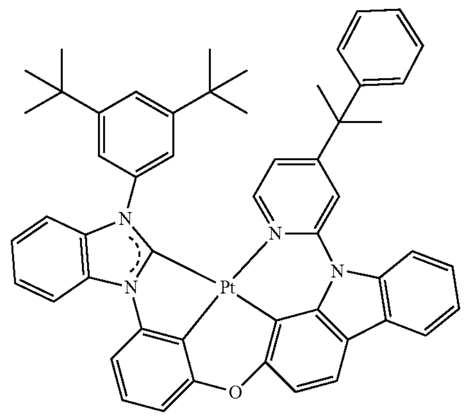
3
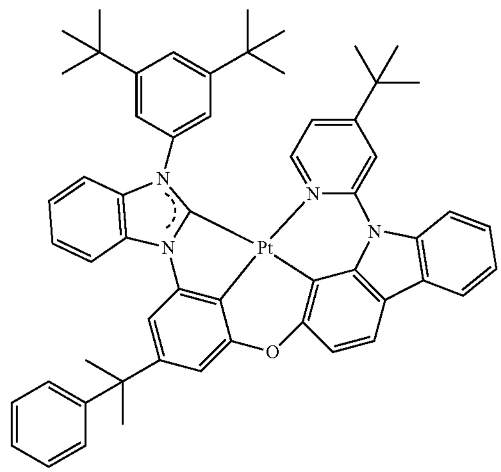
4
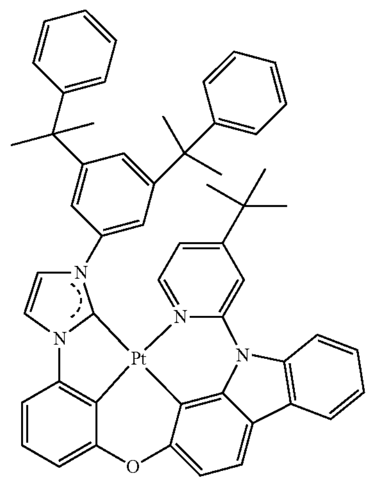

-continued
5
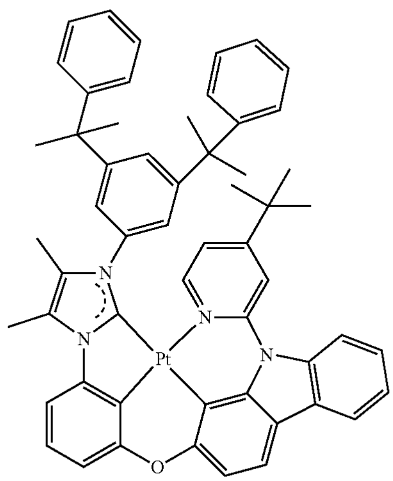
6
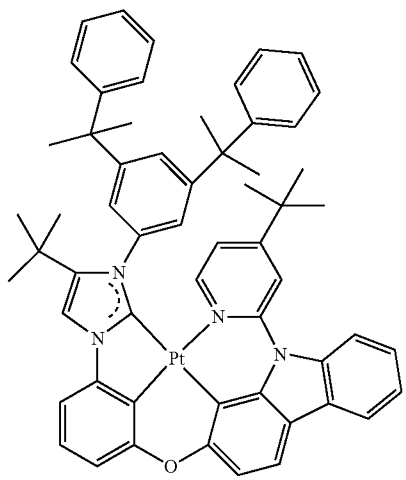
7
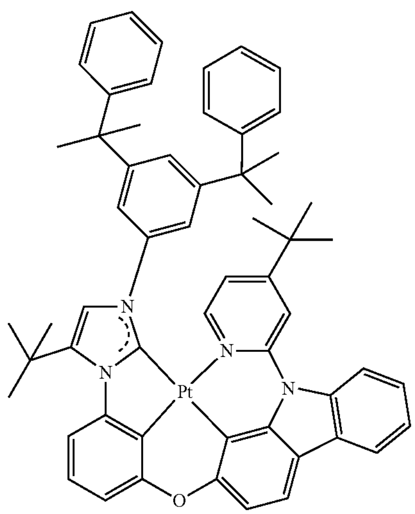
-continued
8
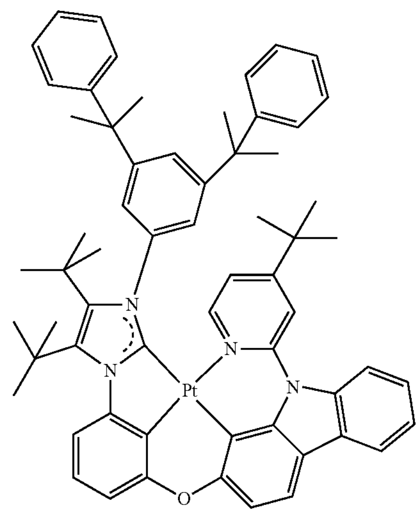
9
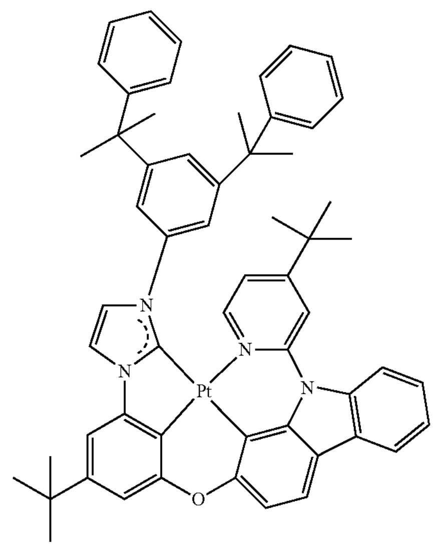
10
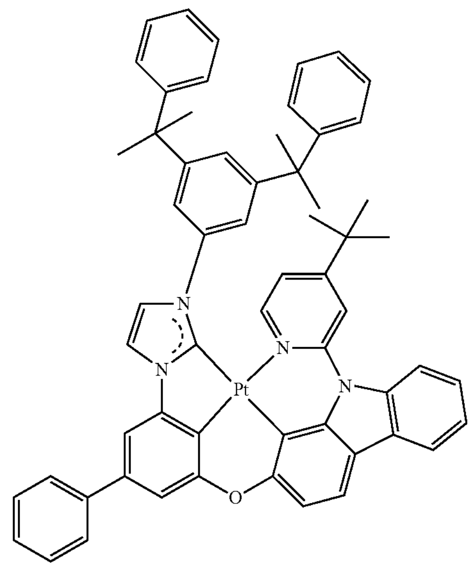

-continued
11
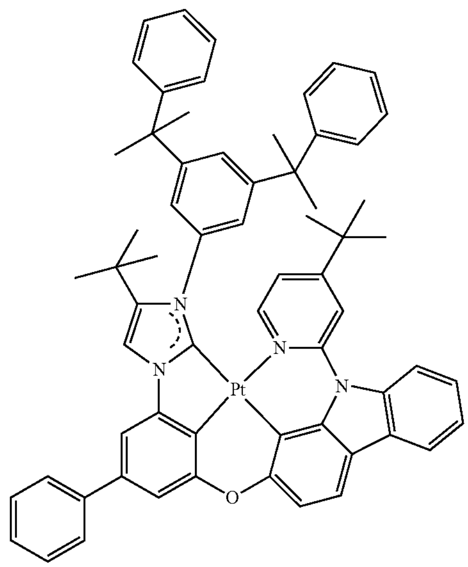
12
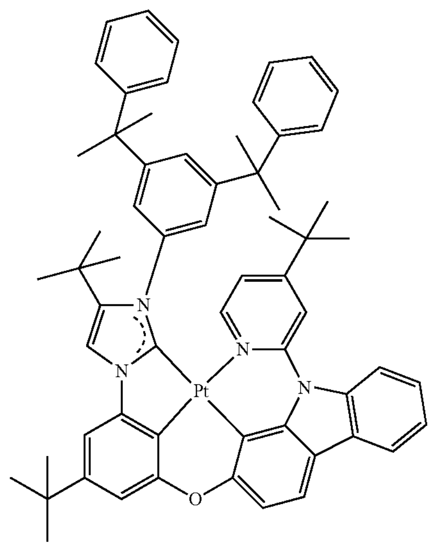
13
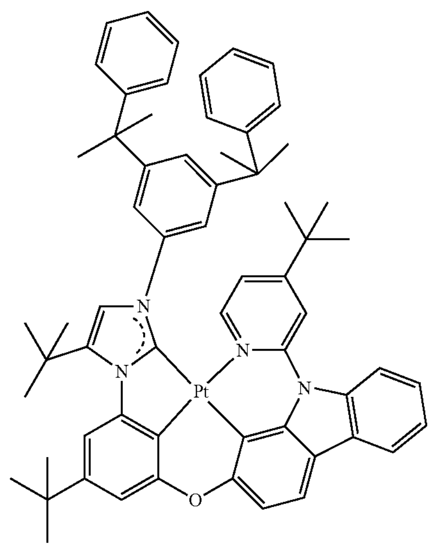
-continued
14
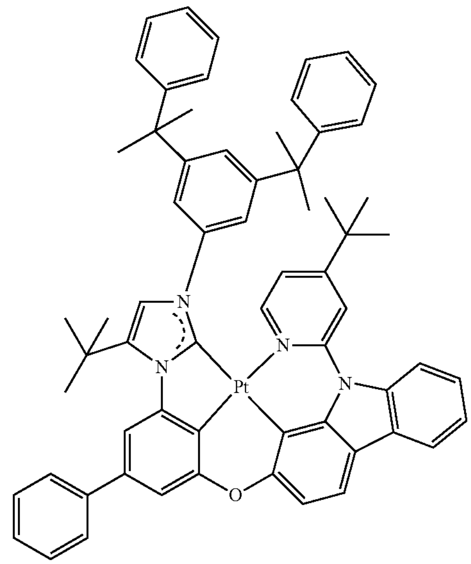
15
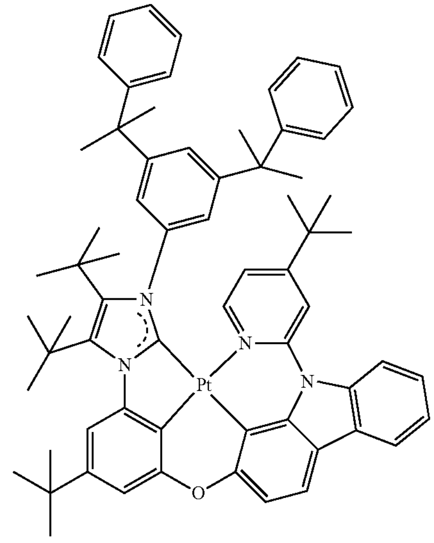
16
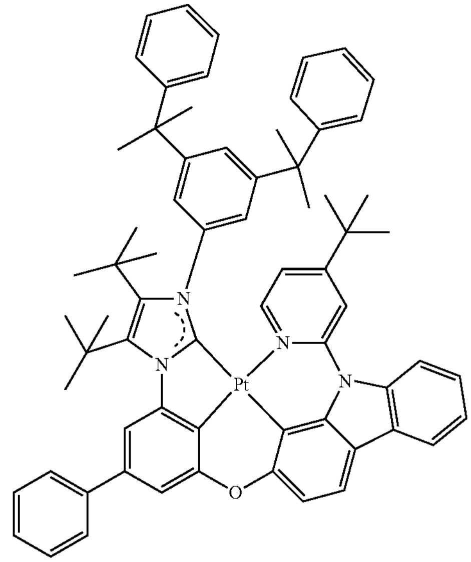

-continued
17
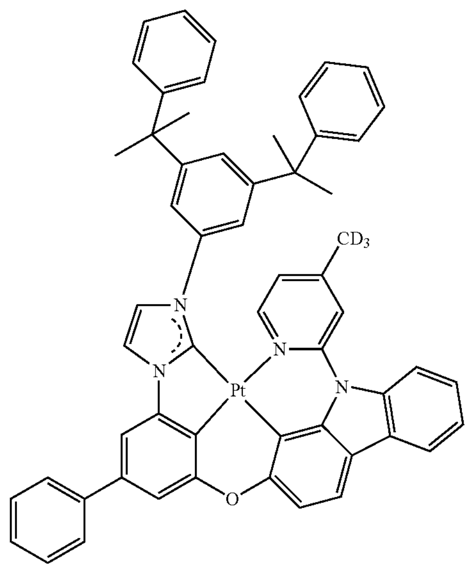
18
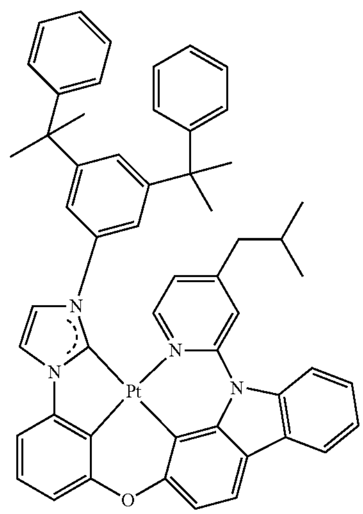
19
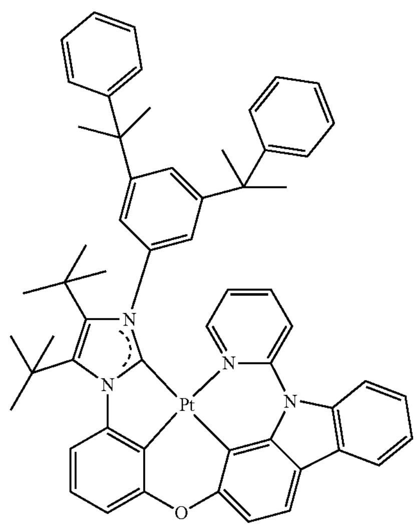
-continued
20
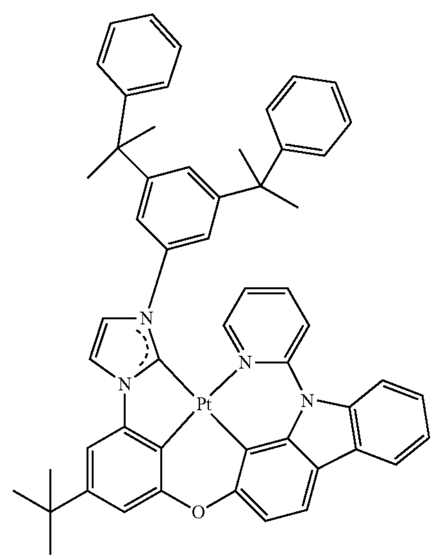
21
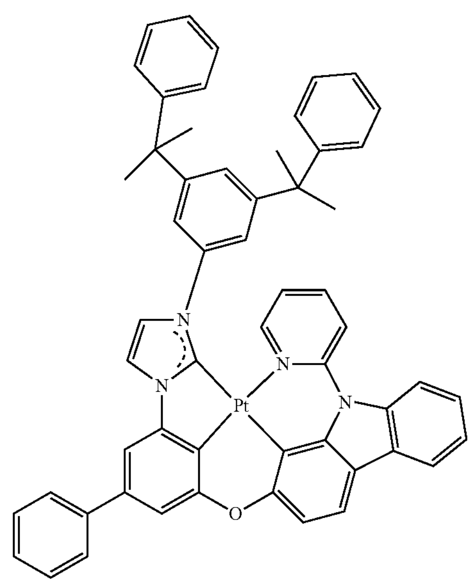

-continued
22
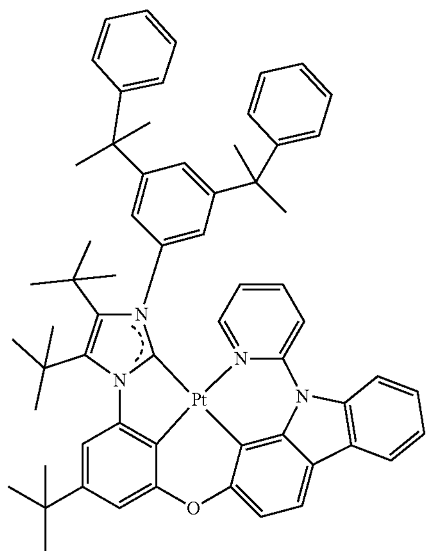
23
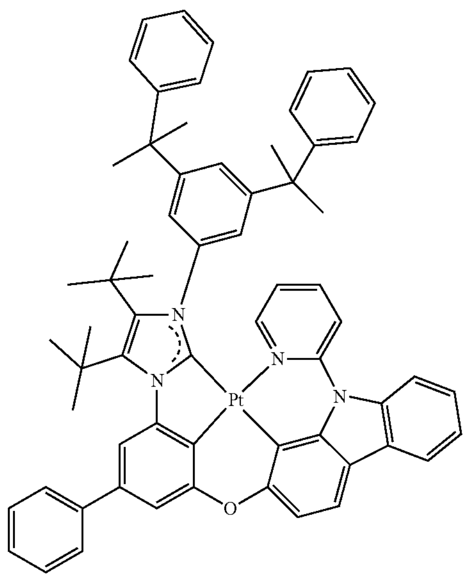
24
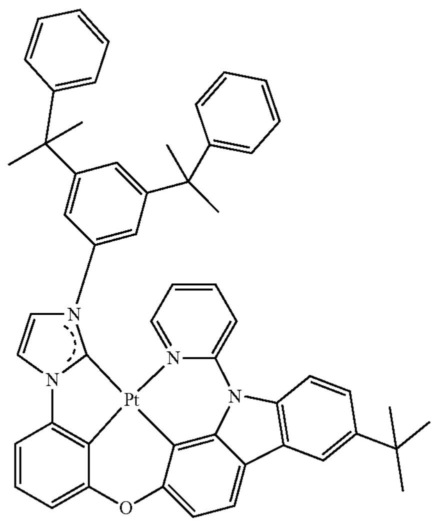
-continued
25
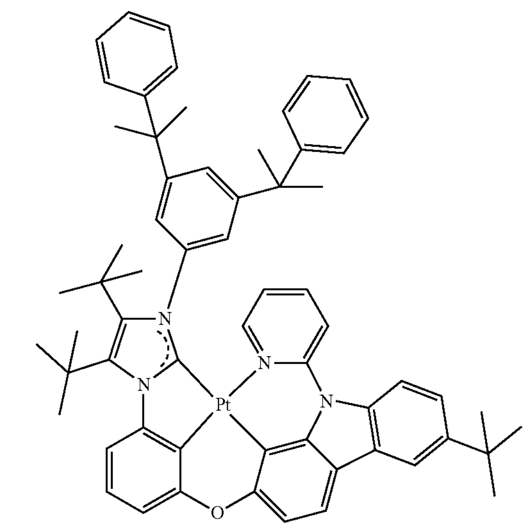
26
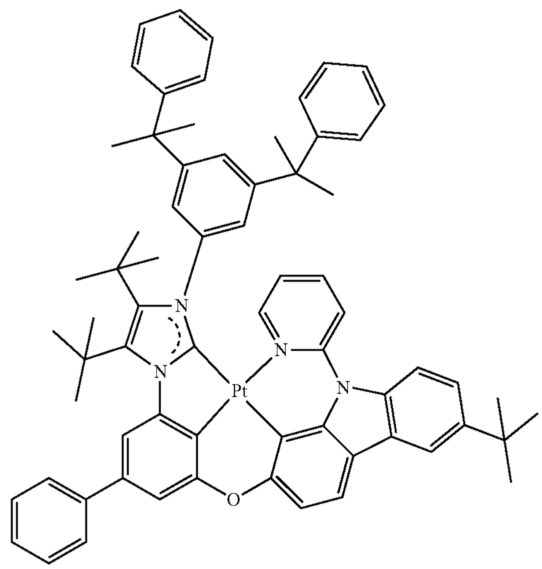
27
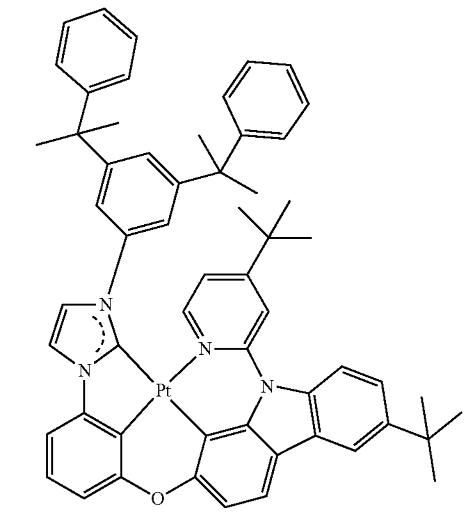

-continued
28
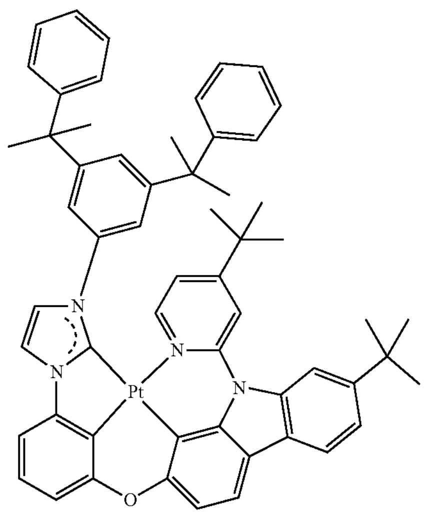
29
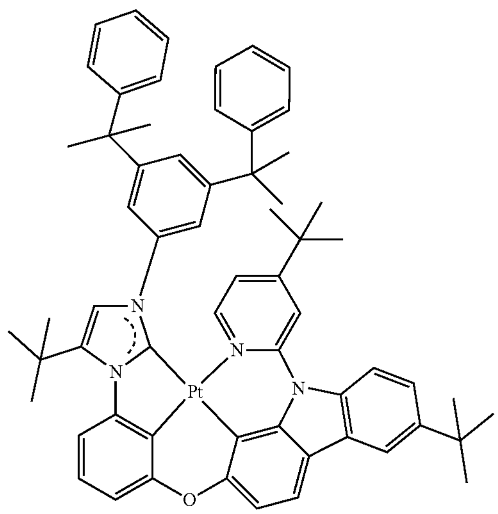
30
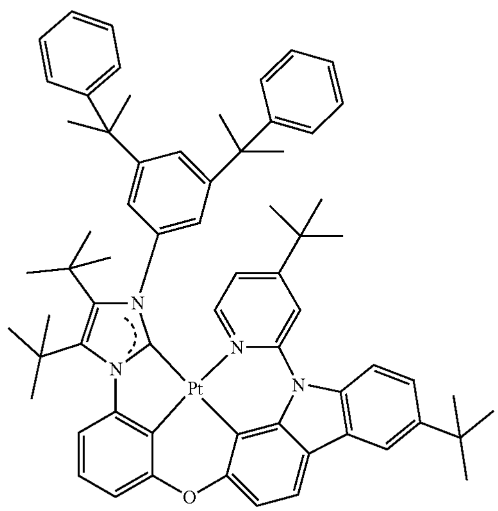
-continued
31
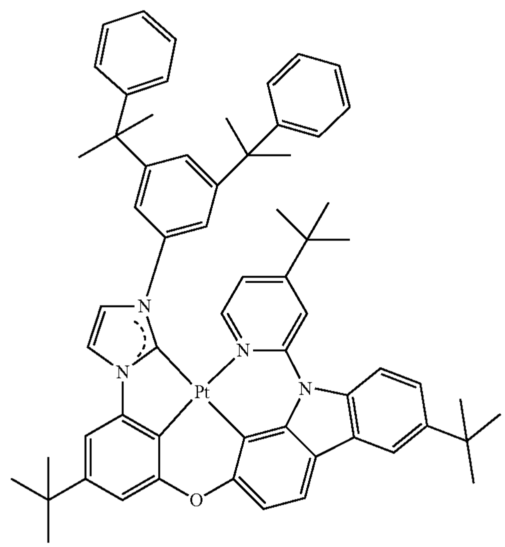
32
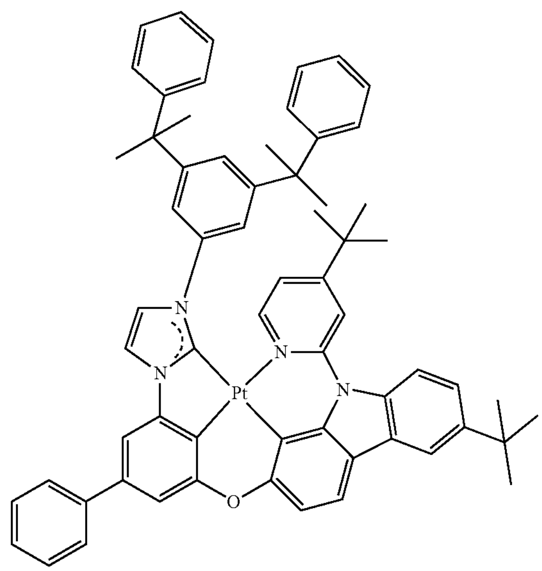
33
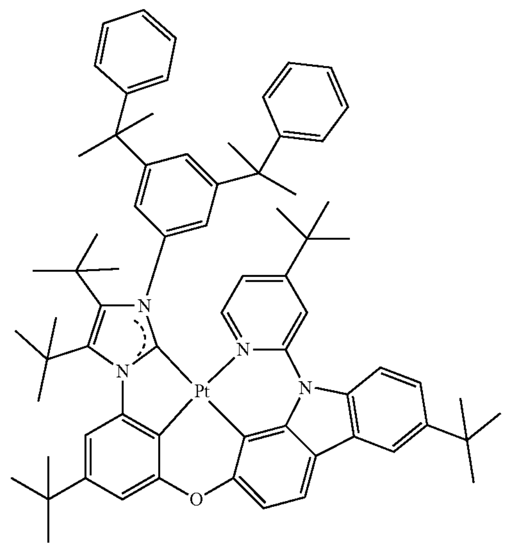

-continued
34
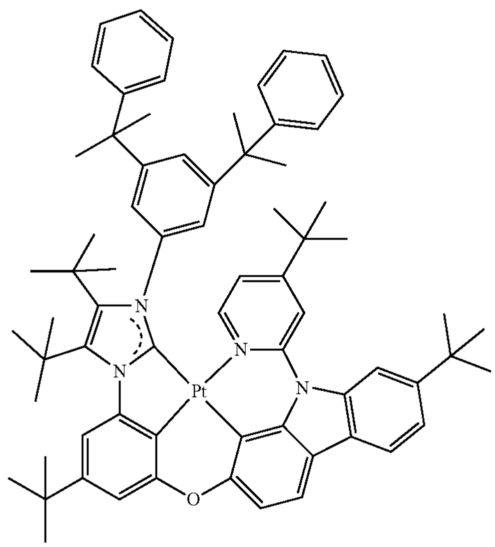
35
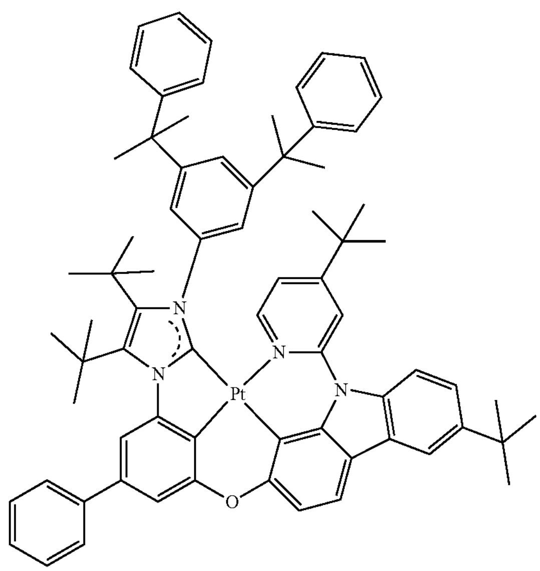
-continued
36
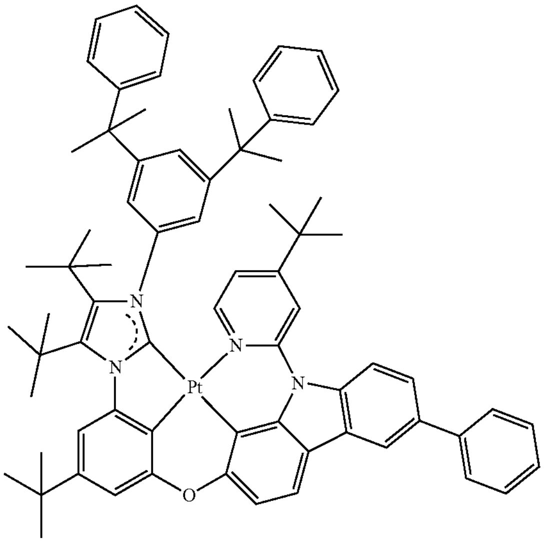
37
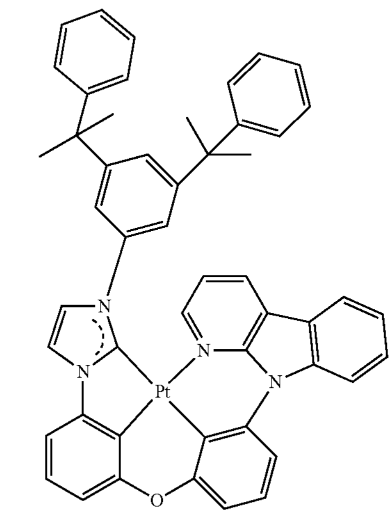

-continued
38
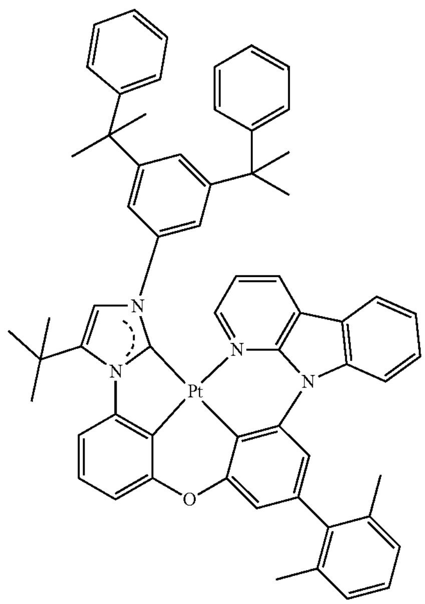
39
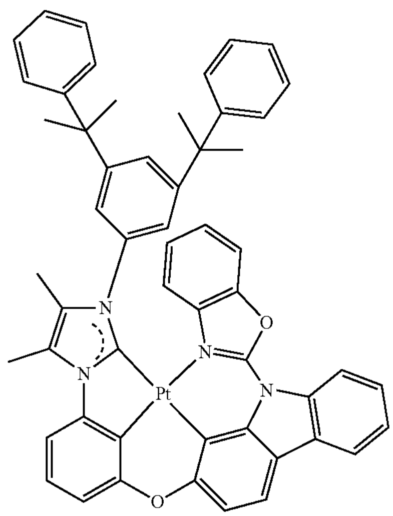
40
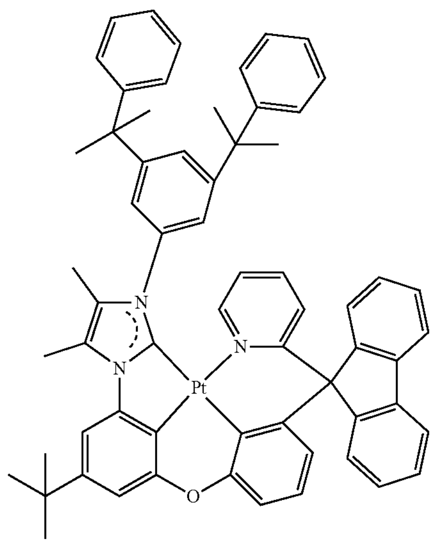
-continued
41
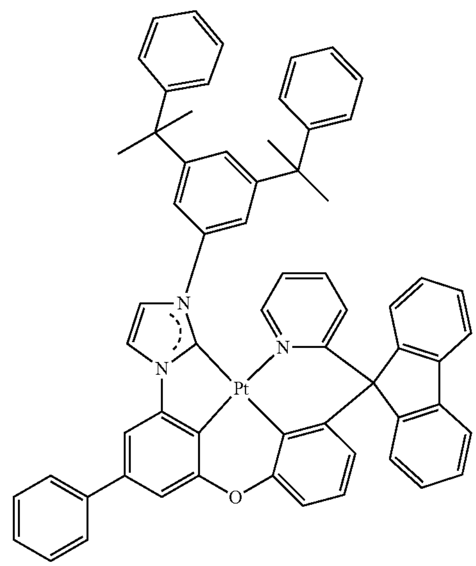
42
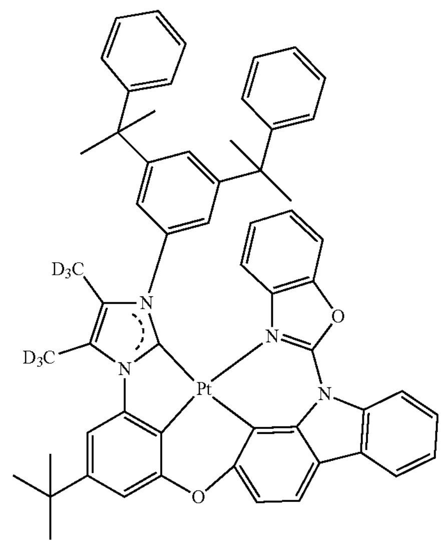
43
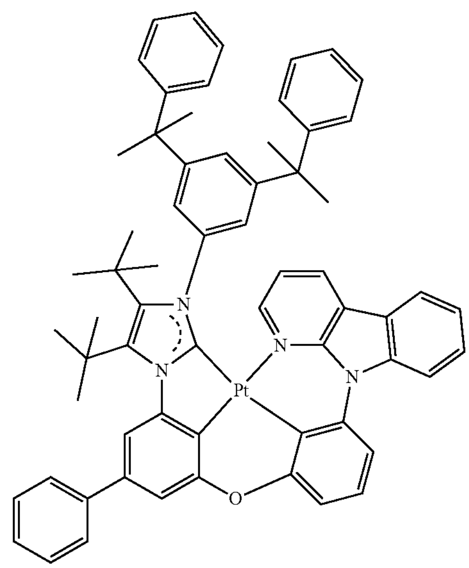

-continued
44
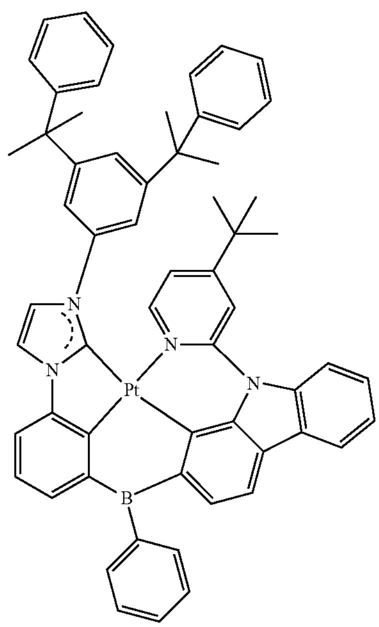
45
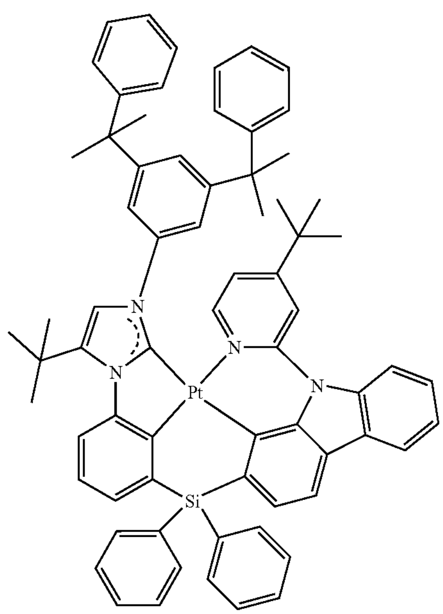
-continued
46
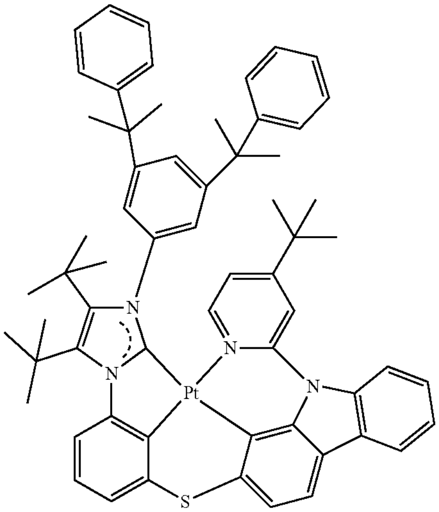
47
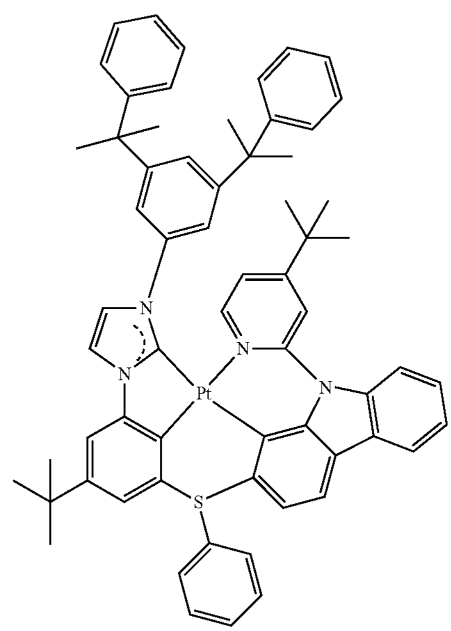

-continued
48
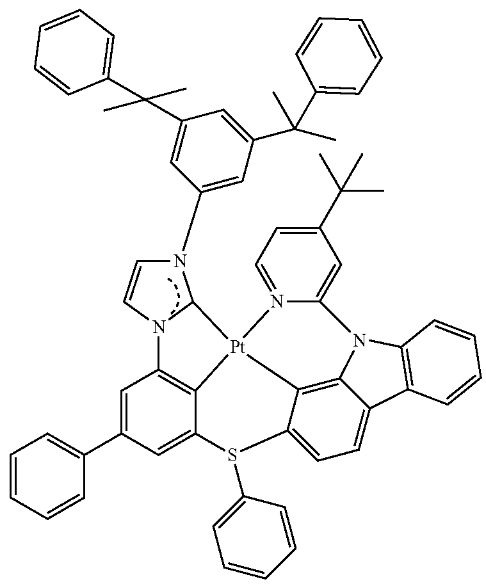
49
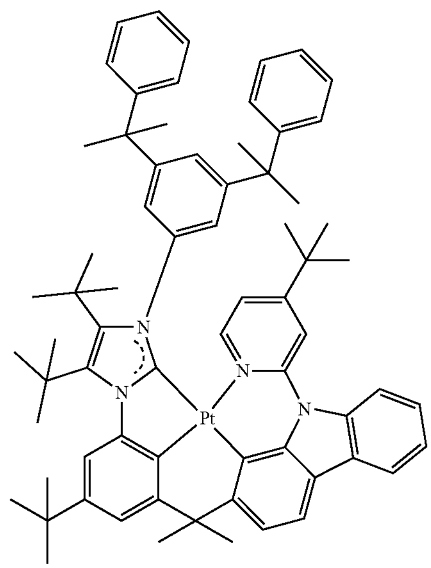
-continued
50
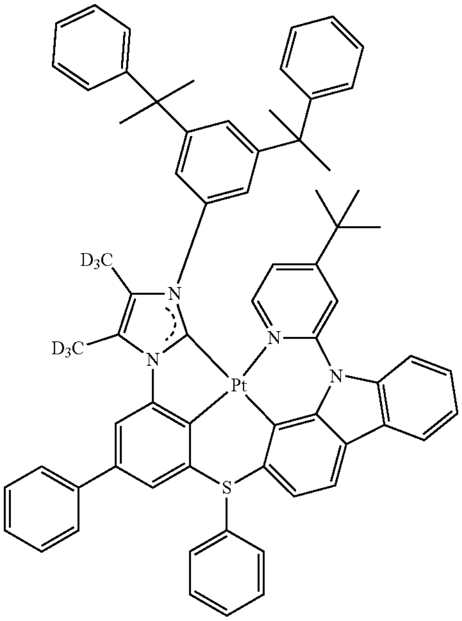
51
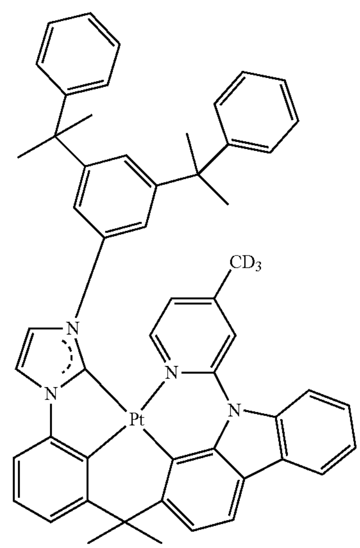

-continued
52
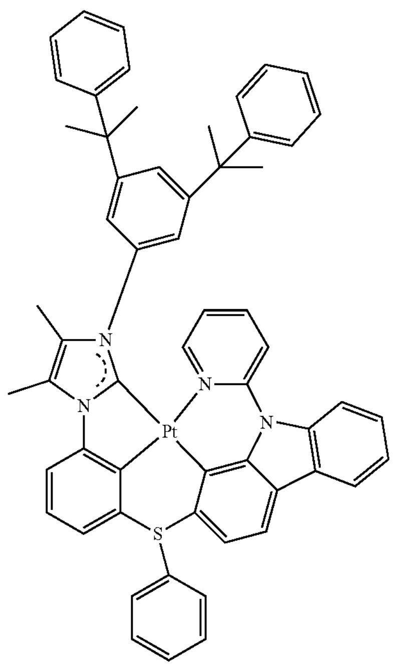
53
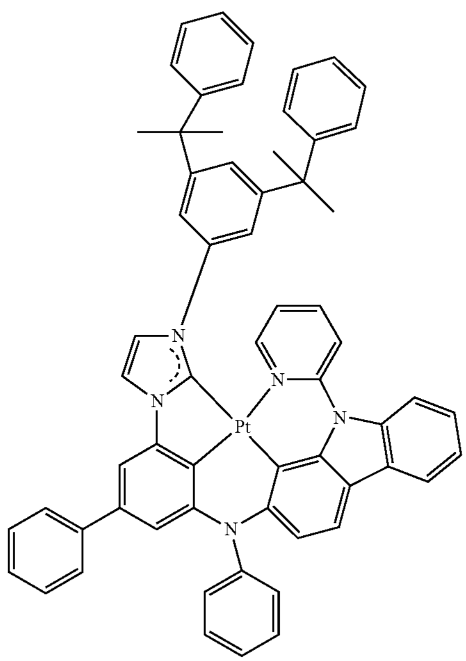
-continued
54
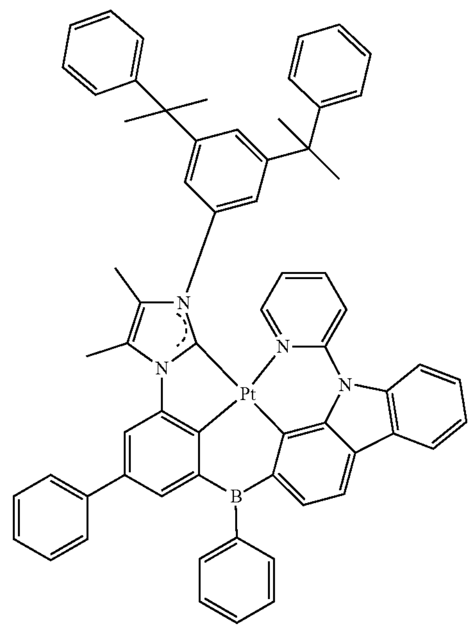
55
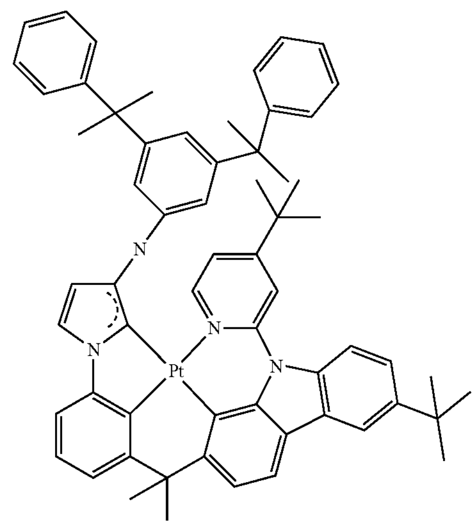

-continued
56
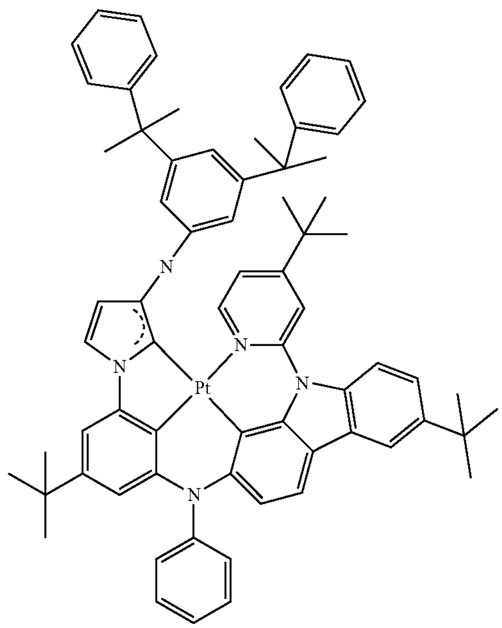
57
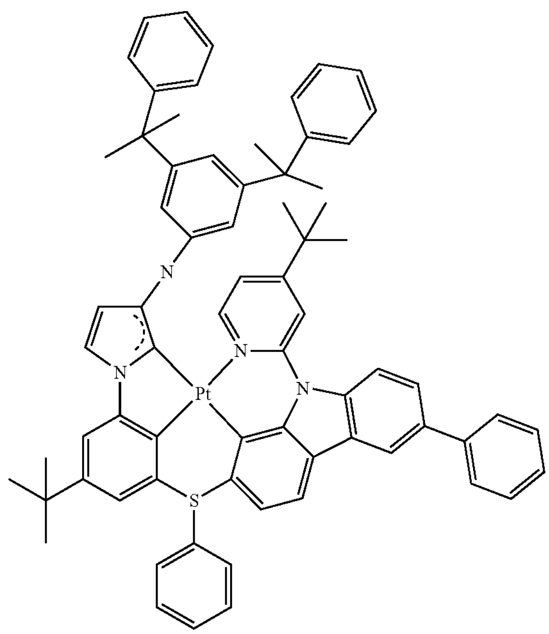
-continued
58
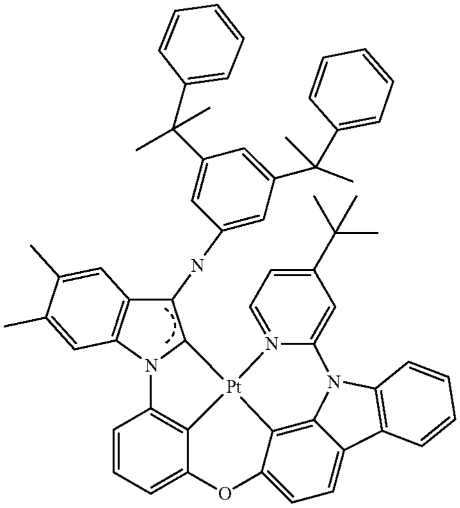
59
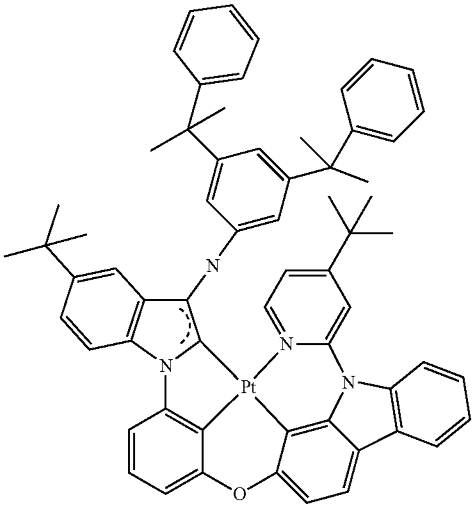
60
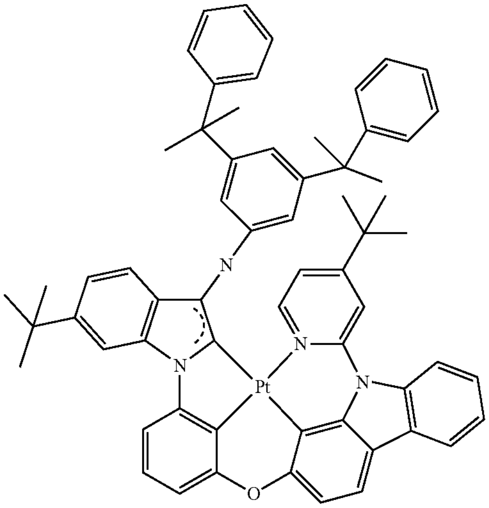

-continued
61
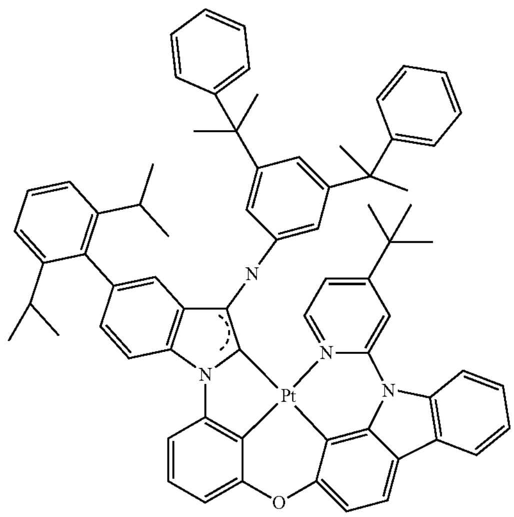
62
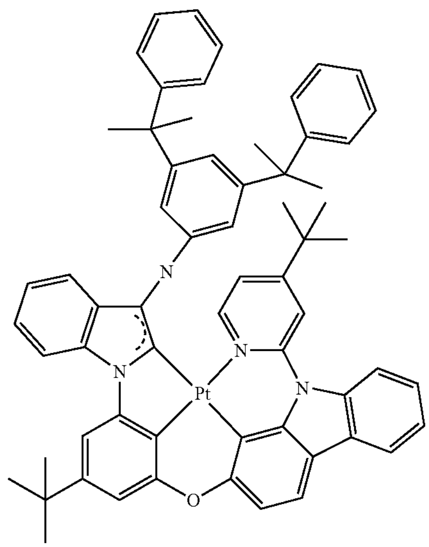
63
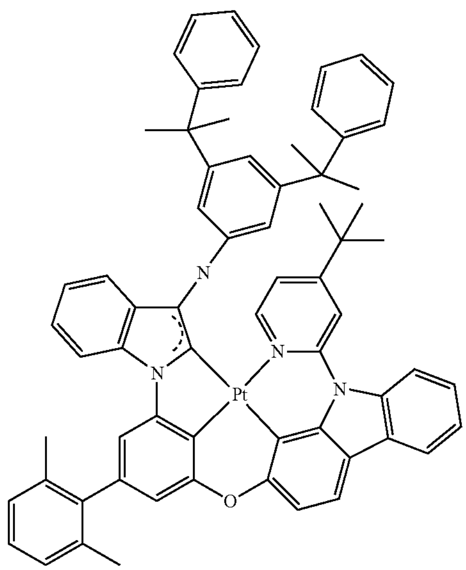
-continued
64
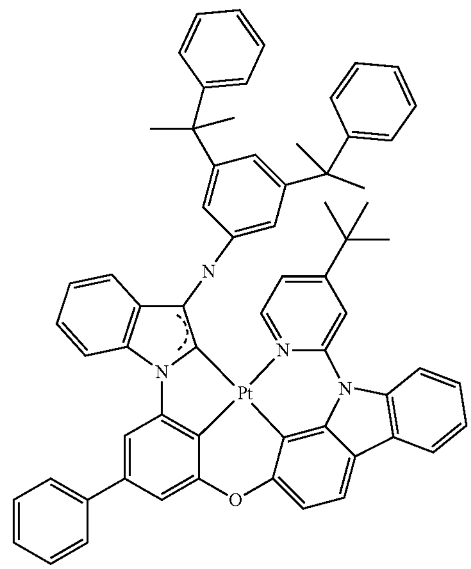
65
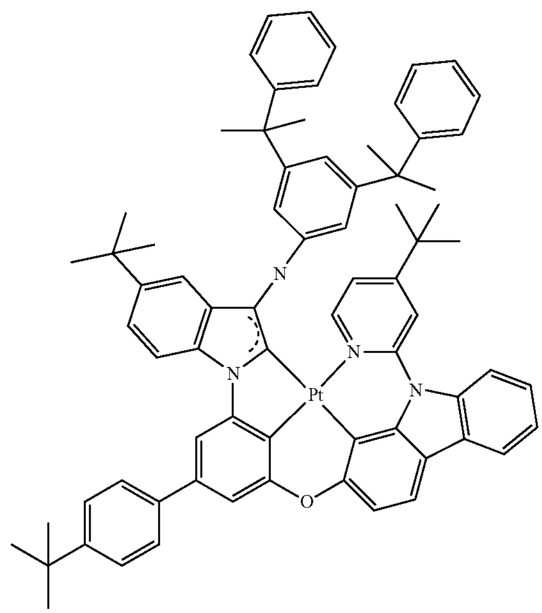

-continued
66
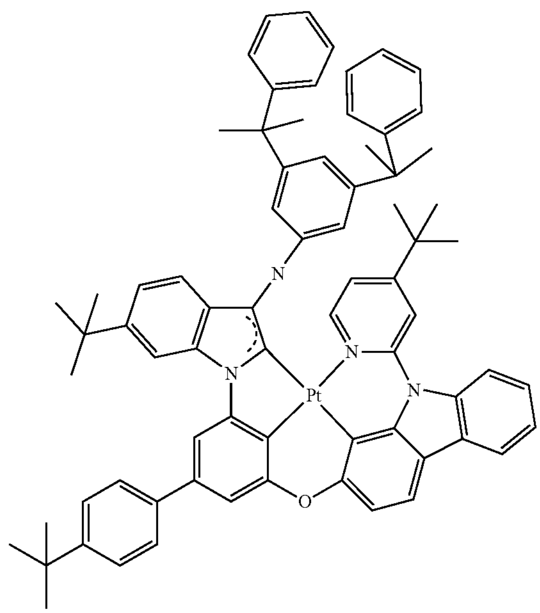
67
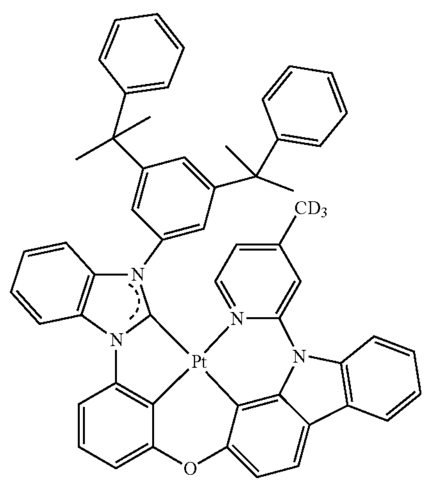
68
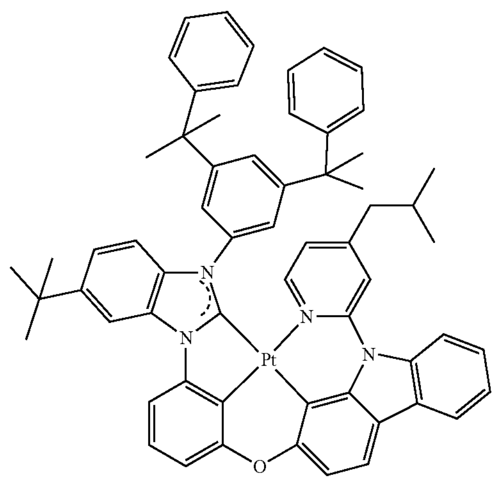
-continued
69
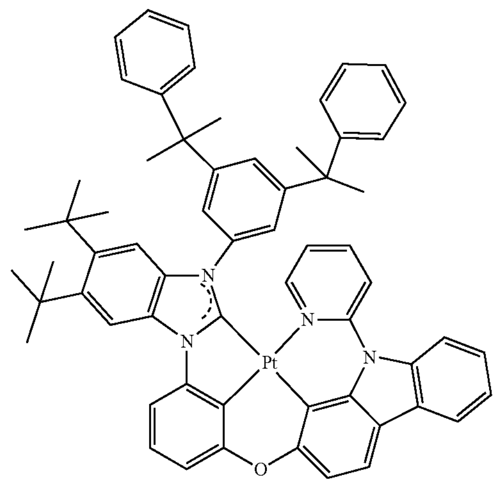
70
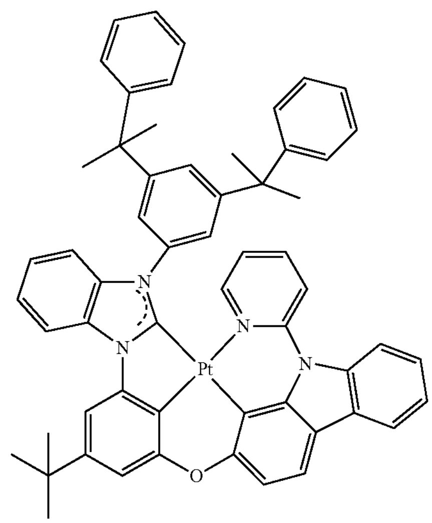
71
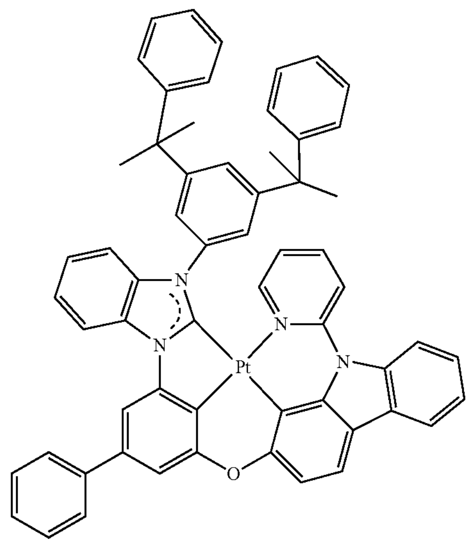

-continued
72
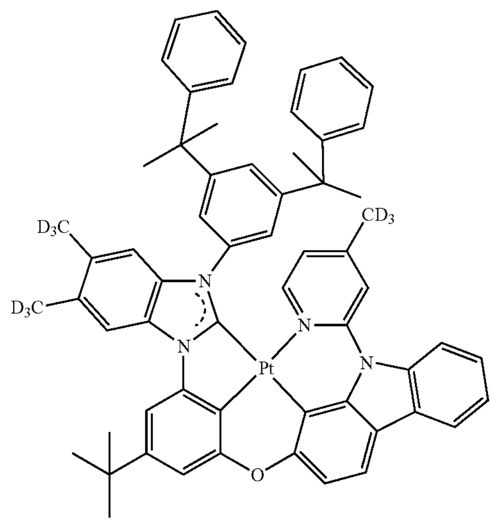
73
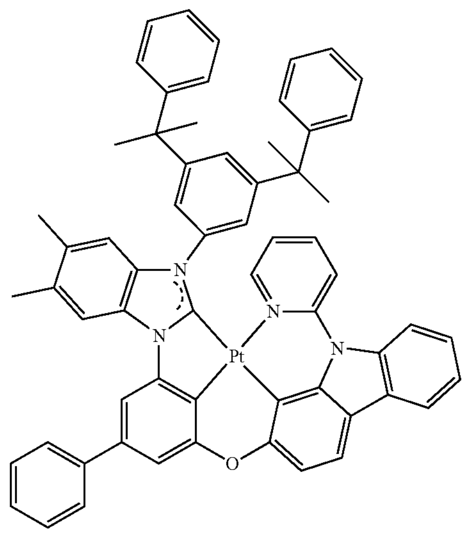
74
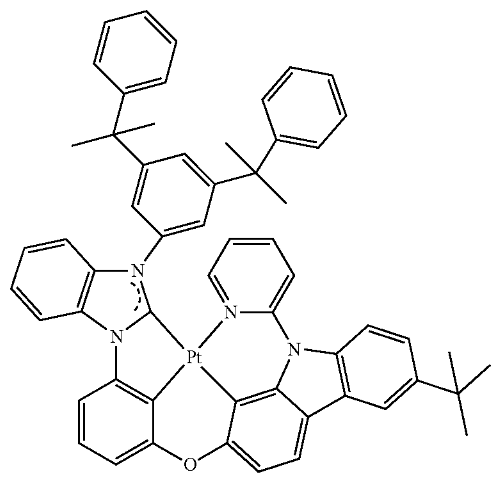
-continued
75
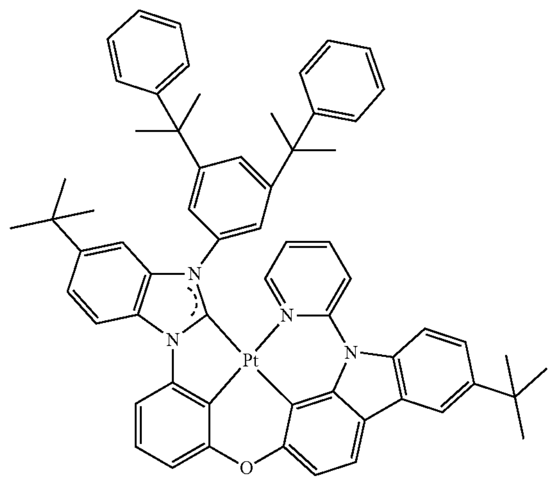
76
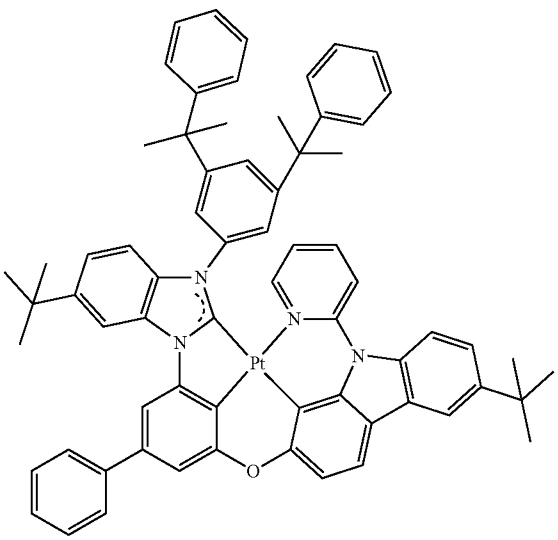
77
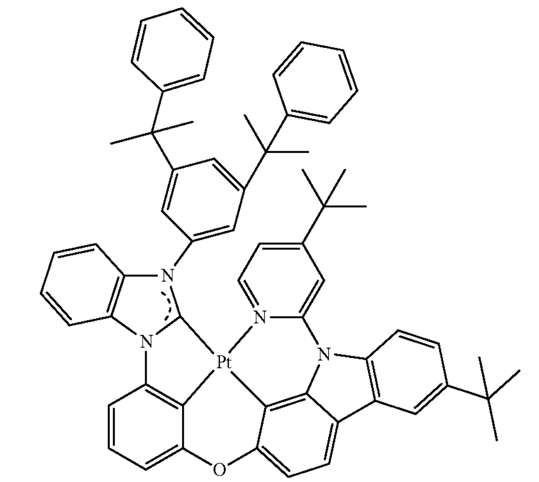

-continued
78
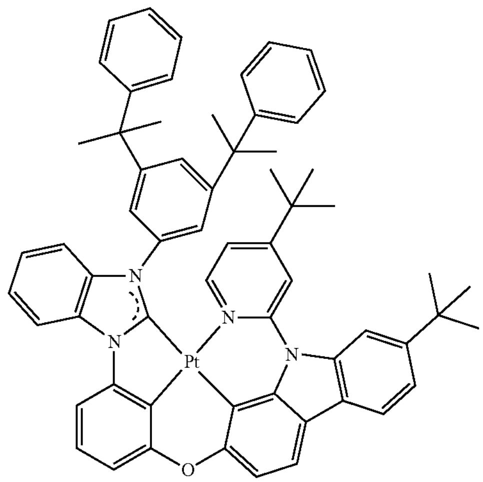
79
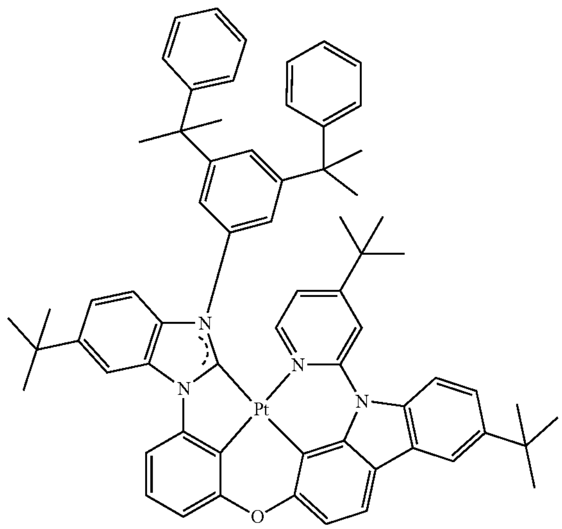
80
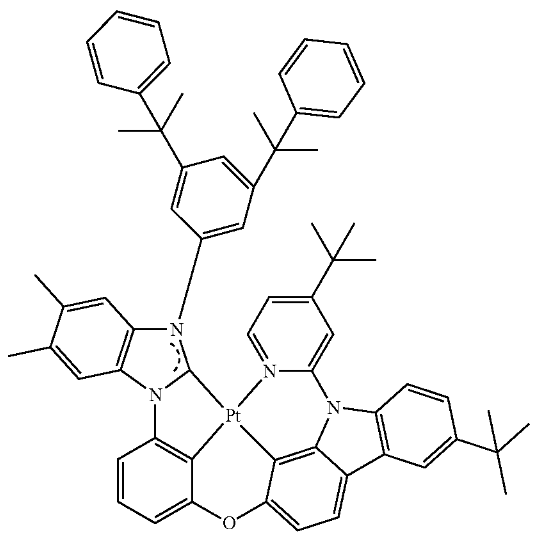
-continued
81
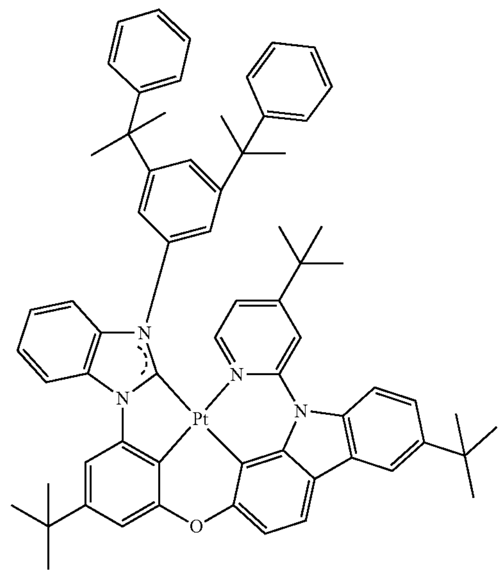
82
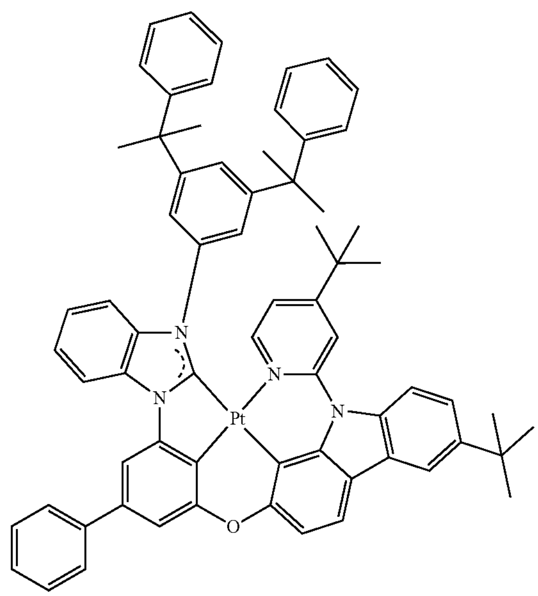

-continued
83
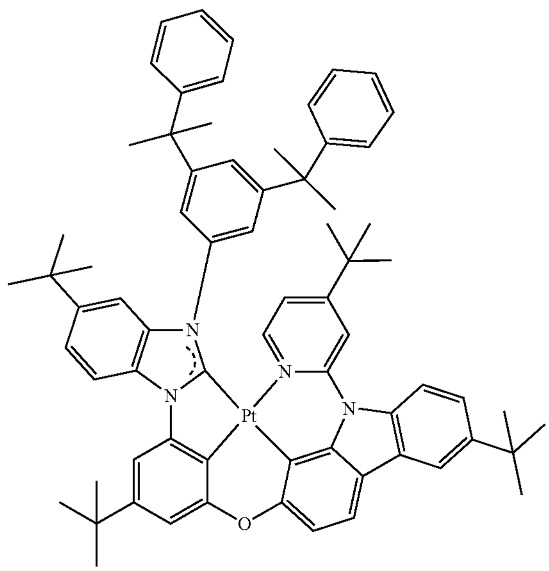
84
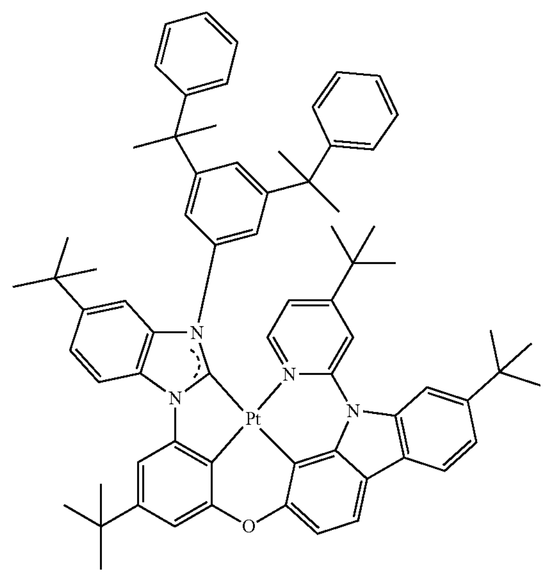
-continued
85
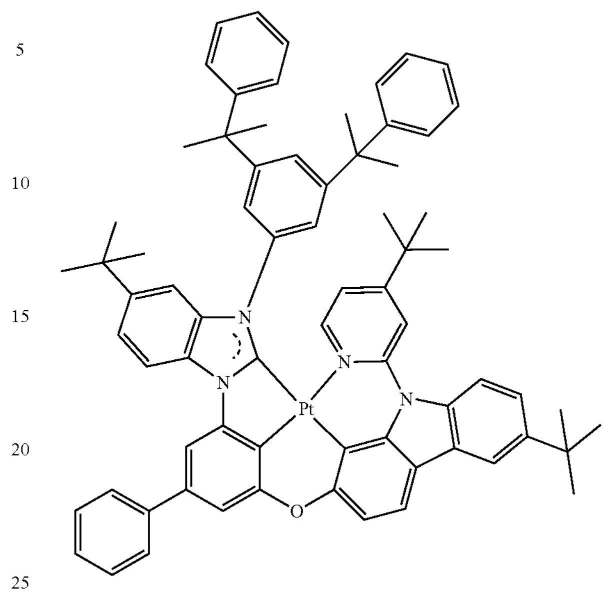
86
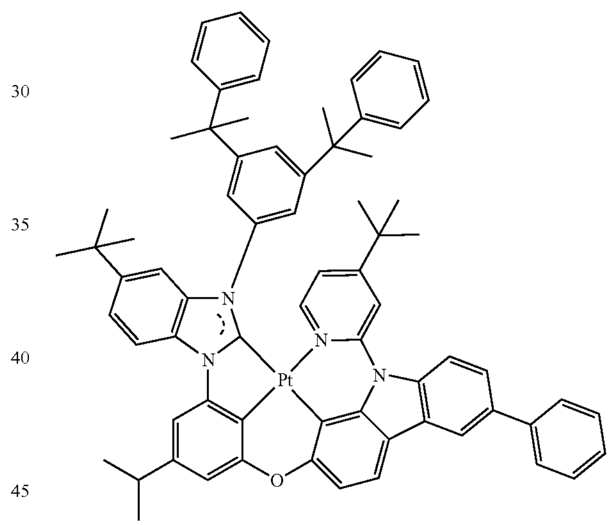
87
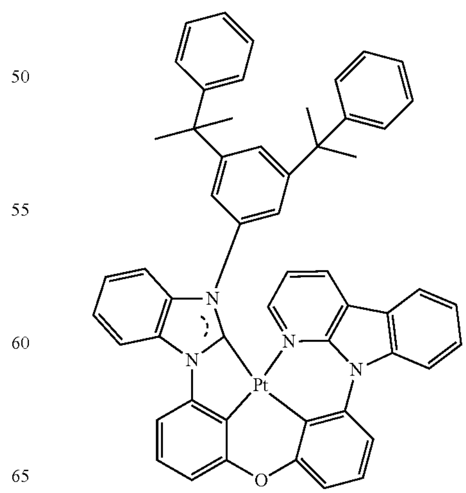

-continued
88
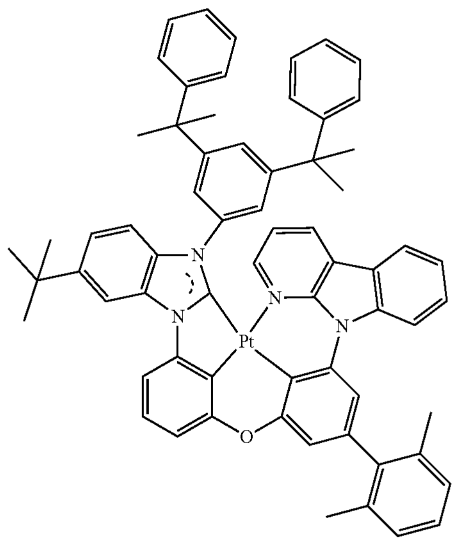
89
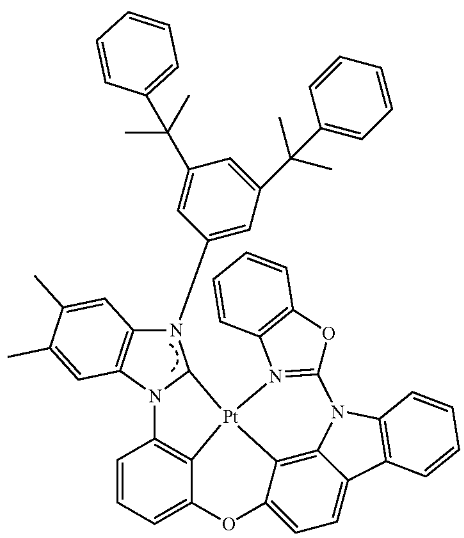
90
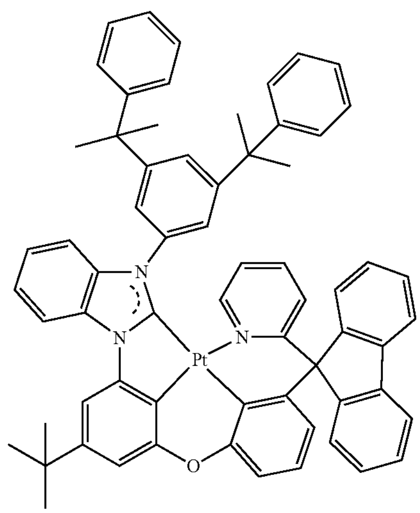
-continued
91
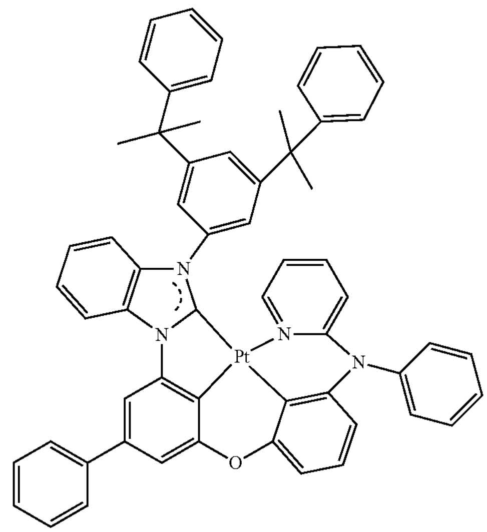
92
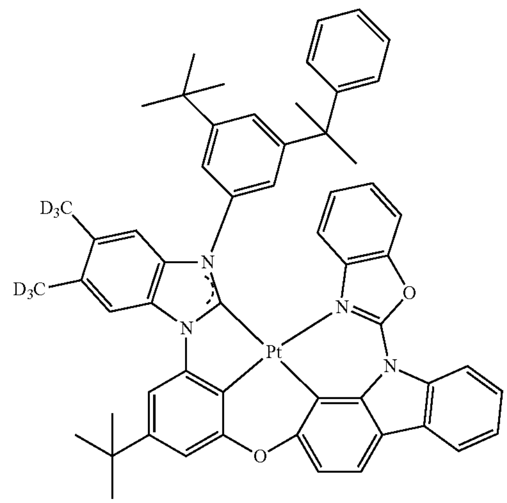
93
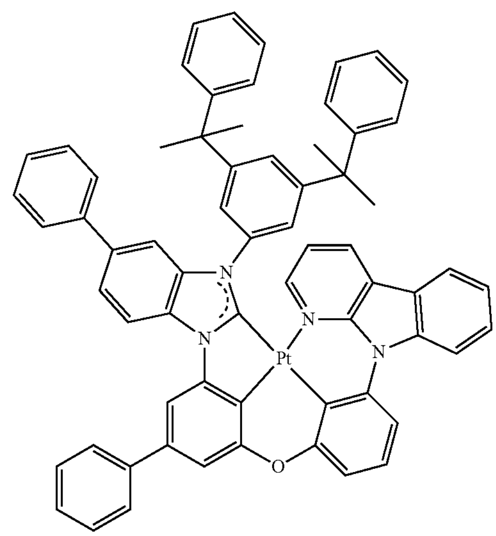

-continued
94
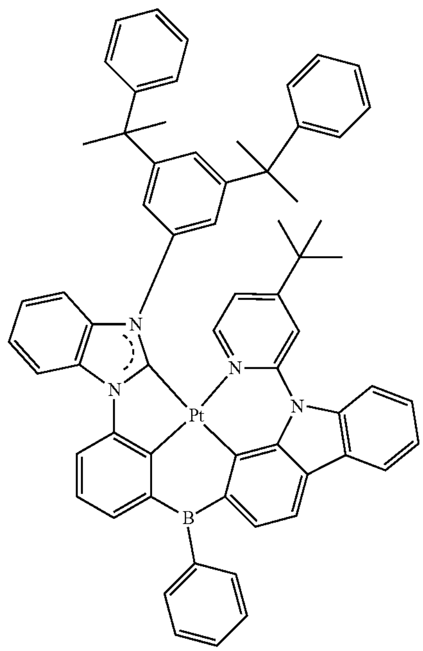
94
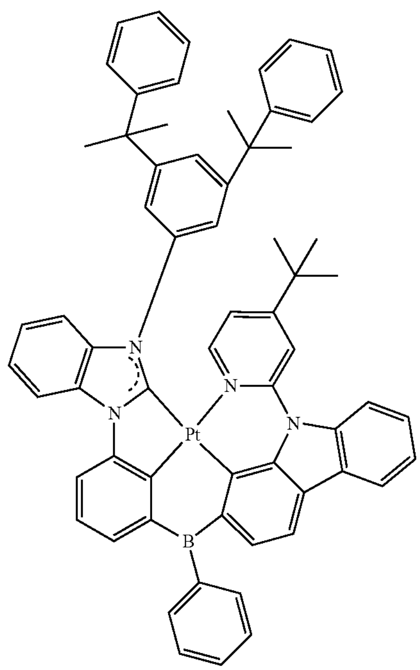
-continued
95
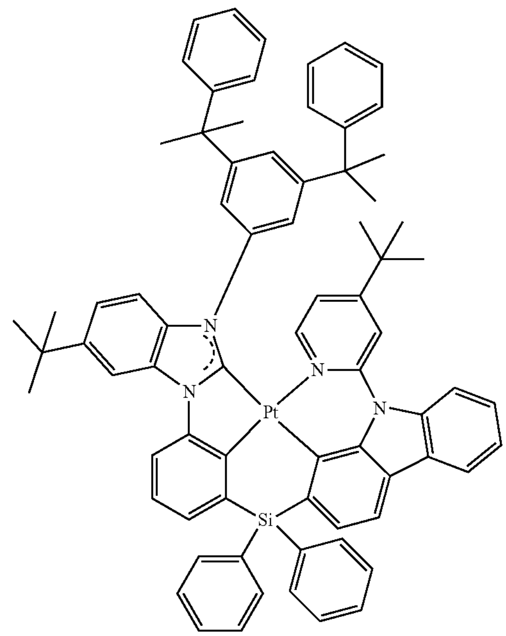
96
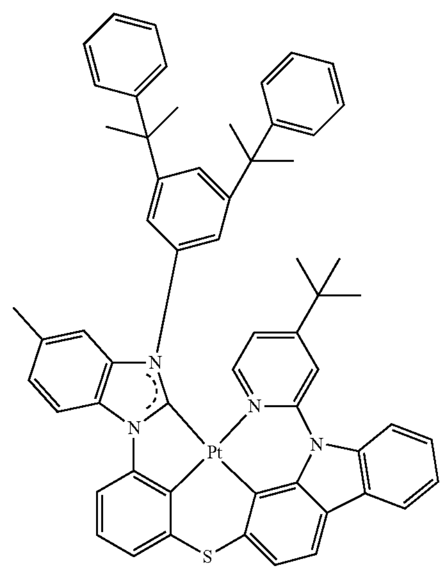

-continued
97
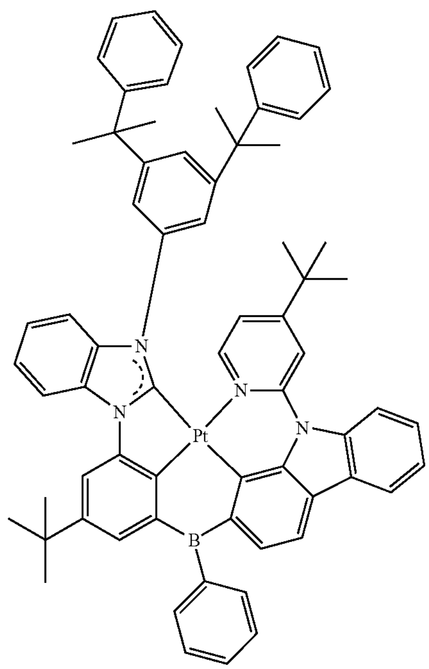
98
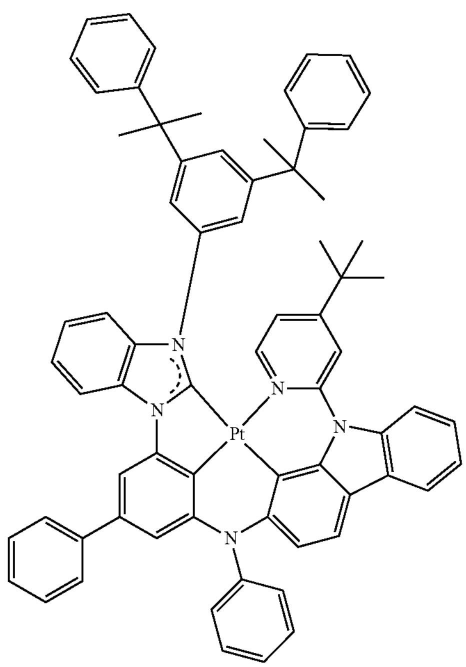
-continued
99
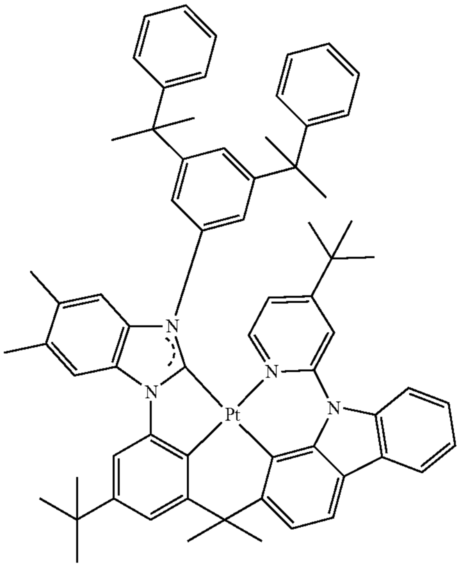
100
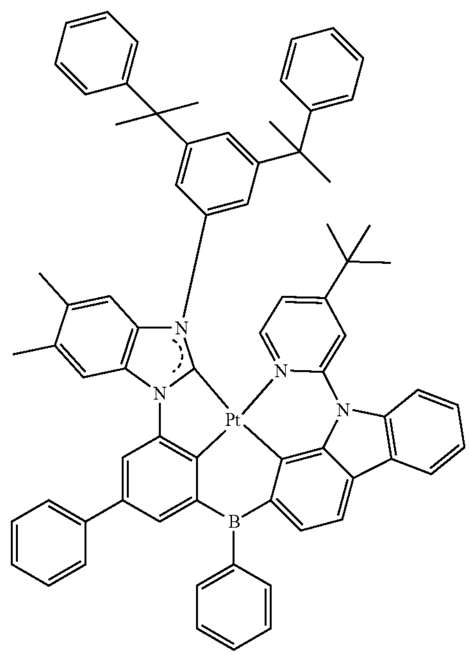

-continued
101
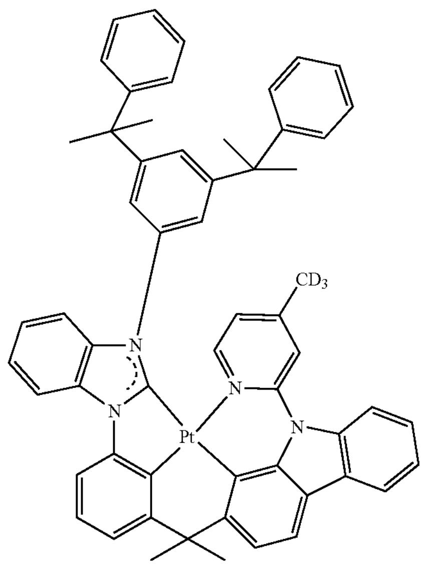
102
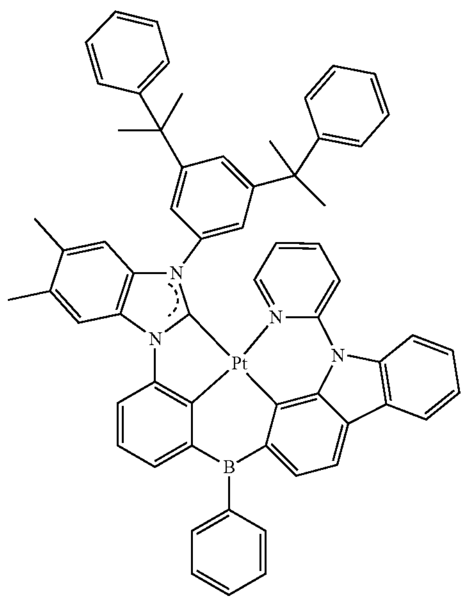
-continued
103
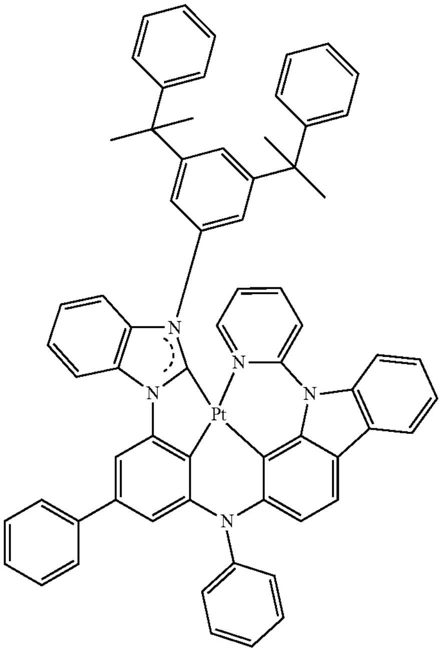
104
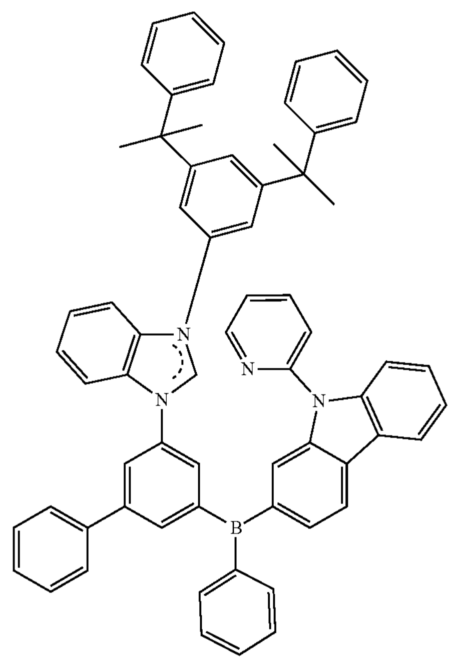

-continued
105
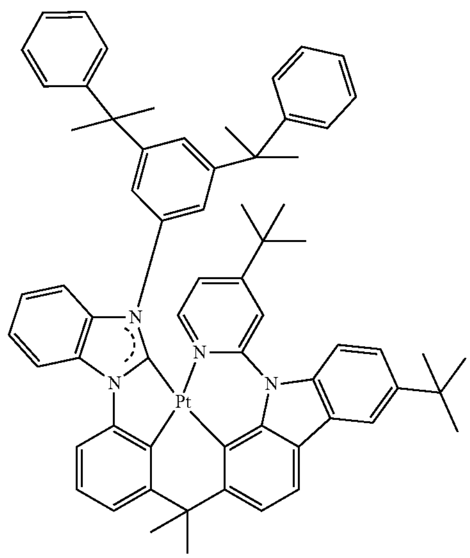
106
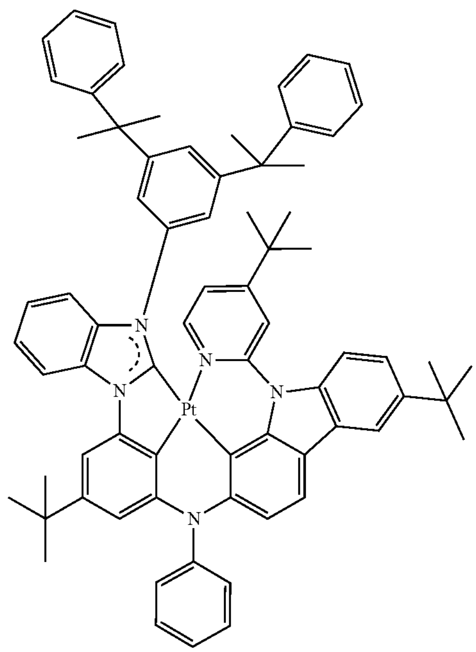
-continued
107
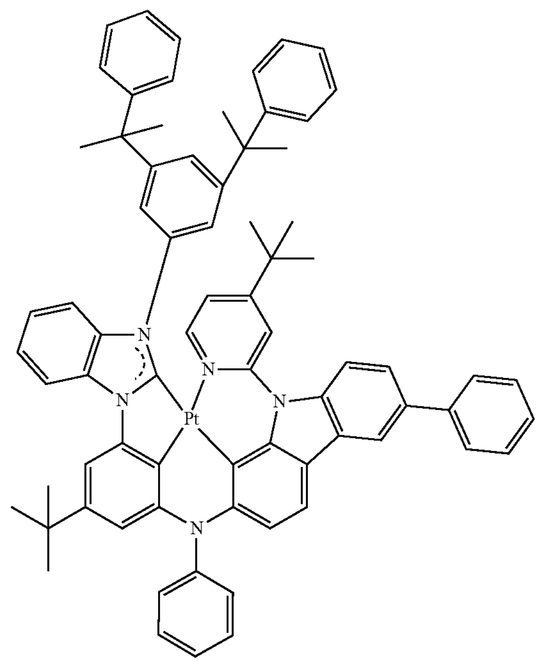
108
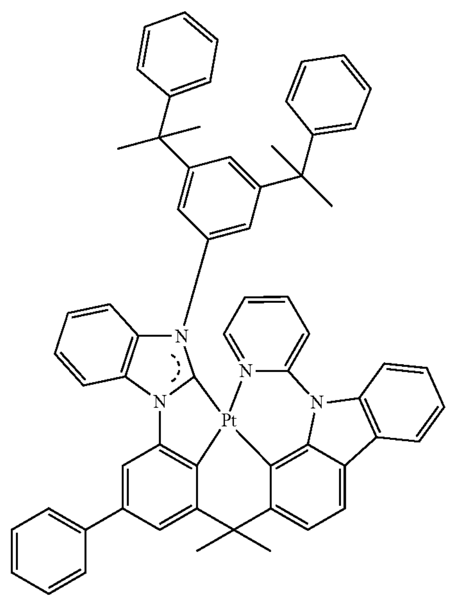

Group IX
1
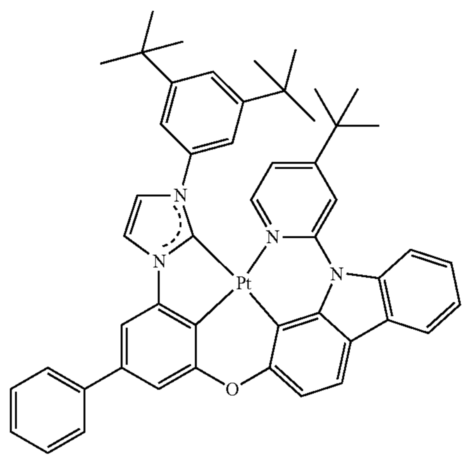
2
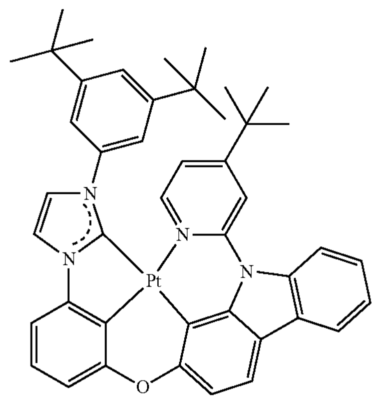
3
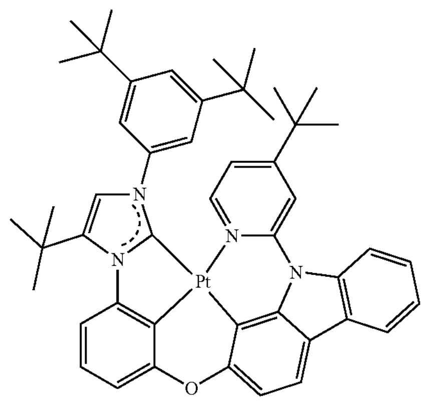
-continued
4
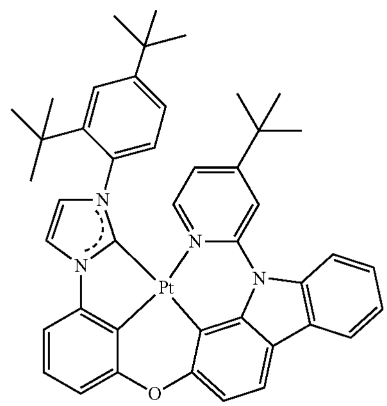
5
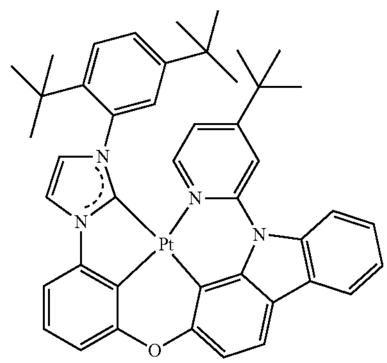
6
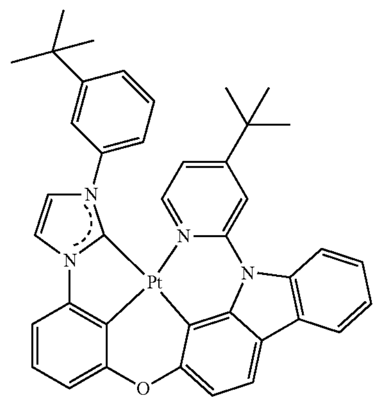
7
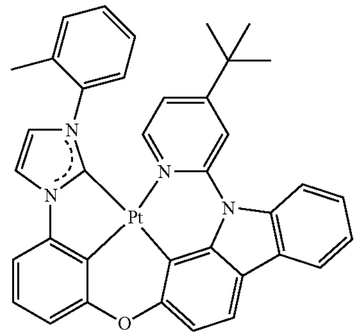

-continued
8
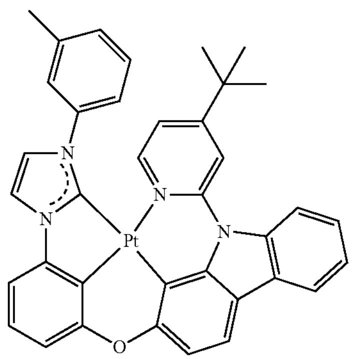
9
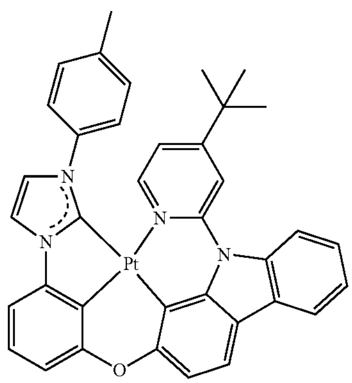
10
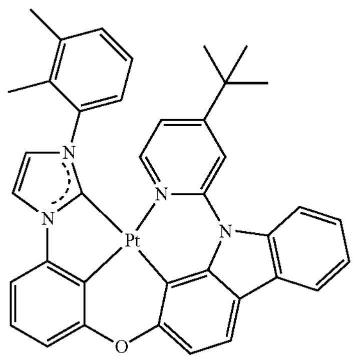
11
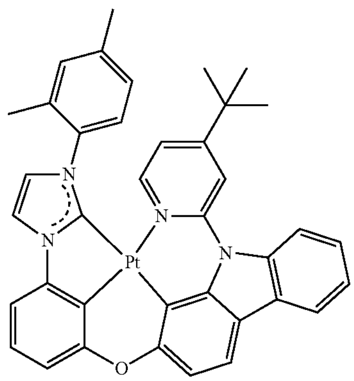
-continued
12
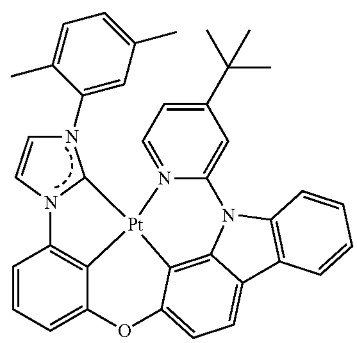
13
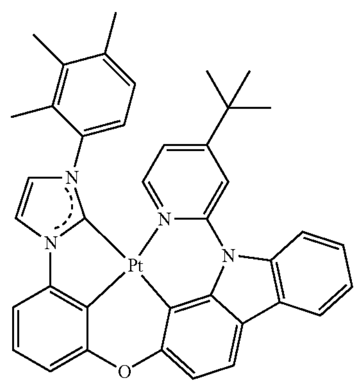
14
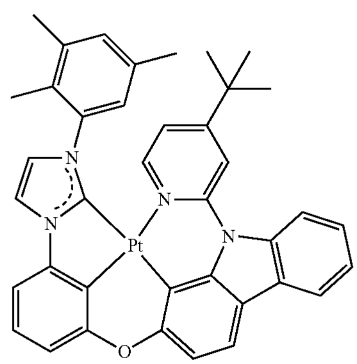
15
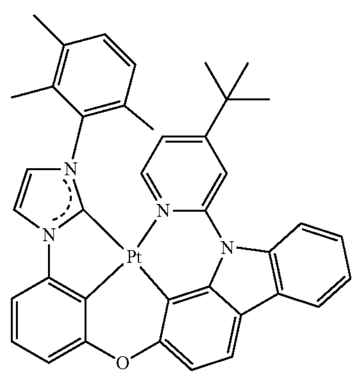

-continued
16
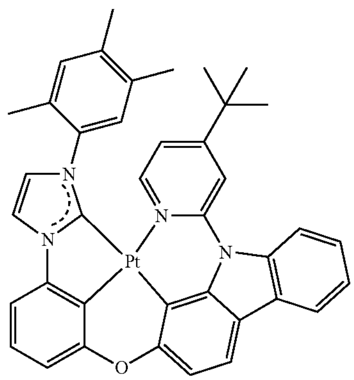
17
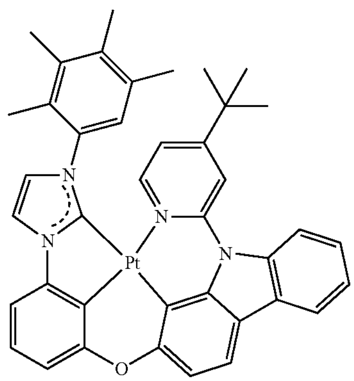
18
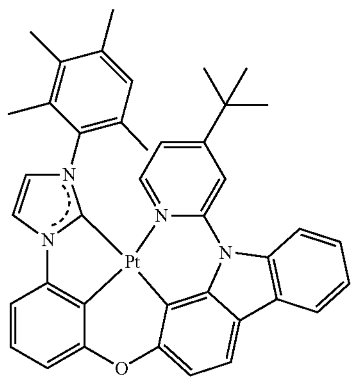
19
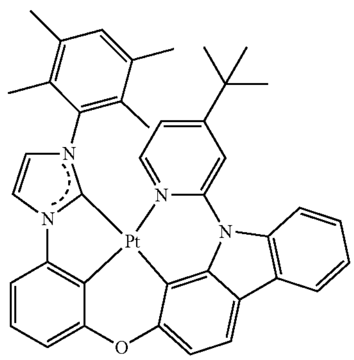
-continued
20
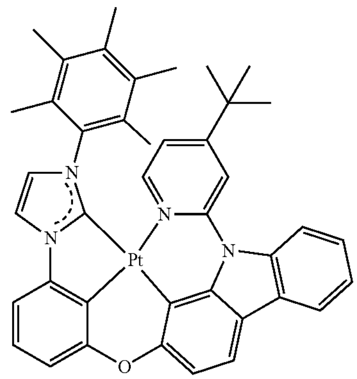
21
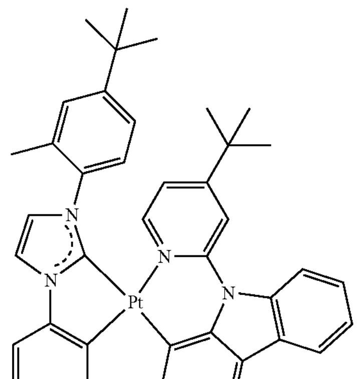
22
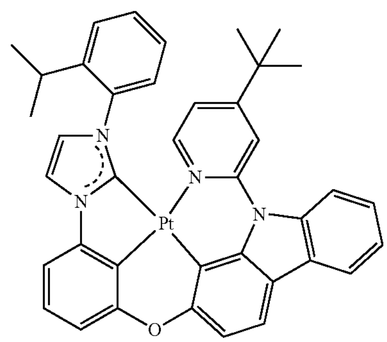
23
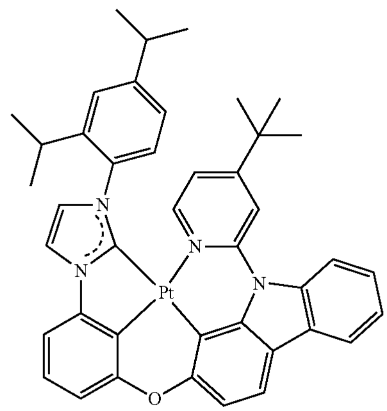

-continued
24
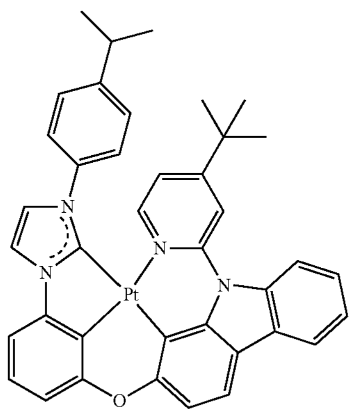
25
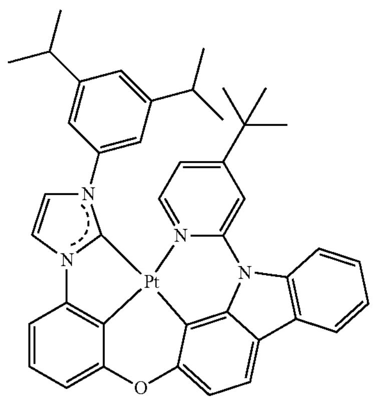
26
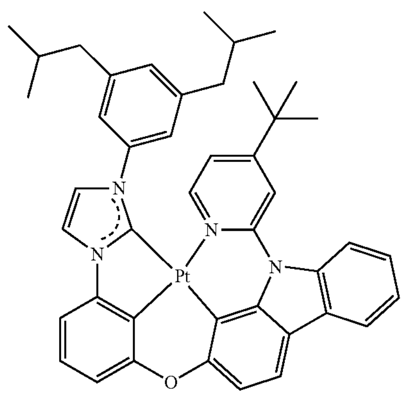
27
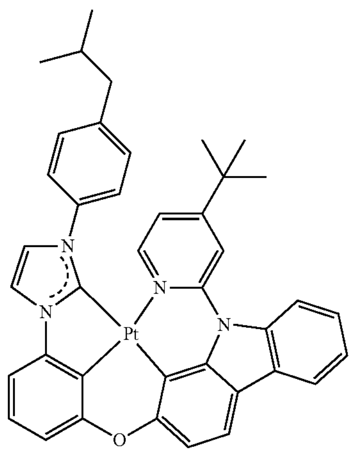
-continued
28
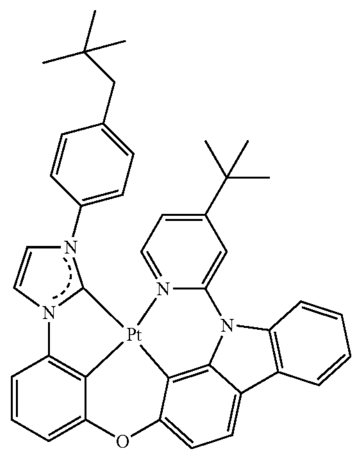
29
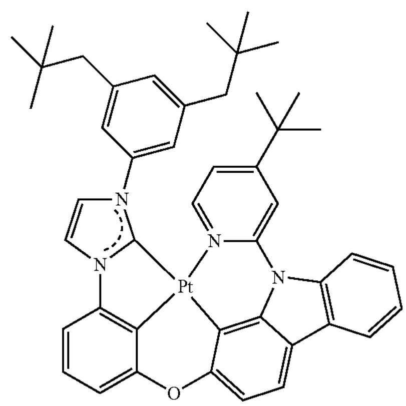
30
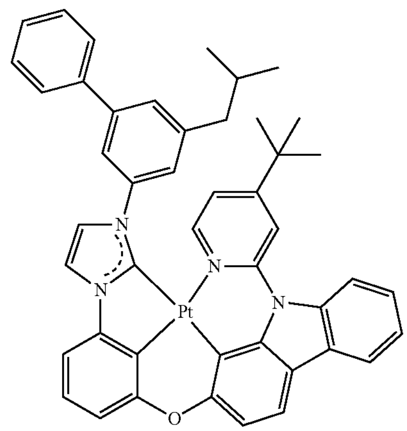
31
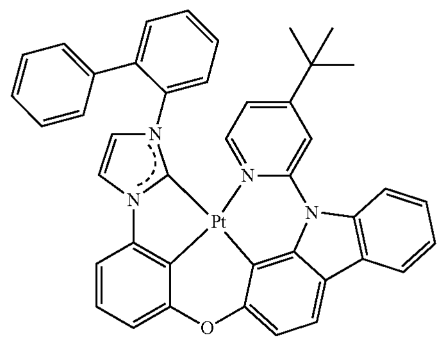

-continued
32
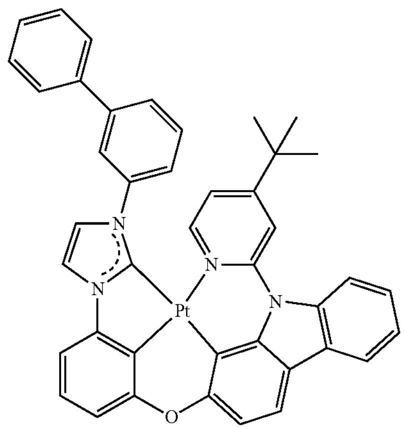
33
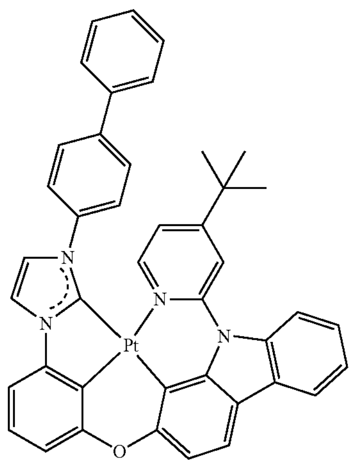
34
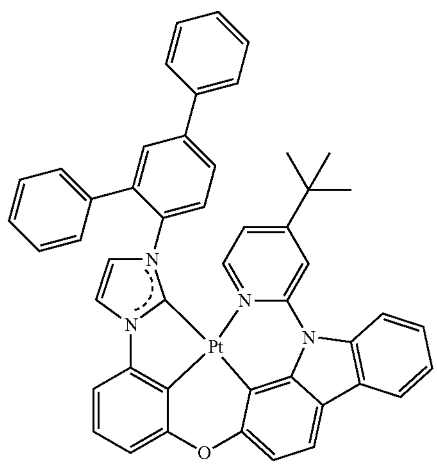
-continued
35
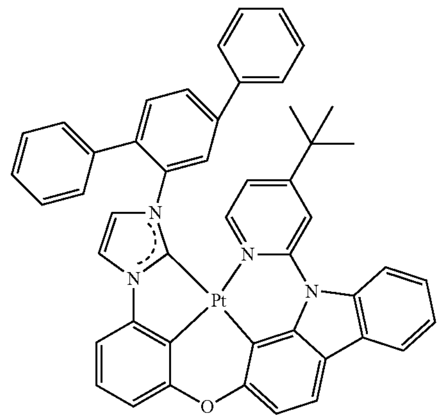
36
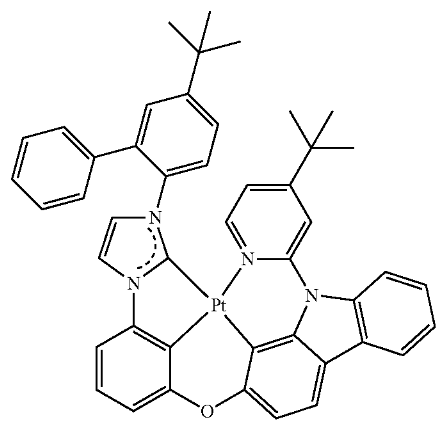
37
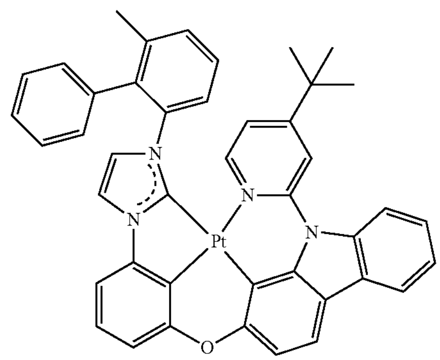
38
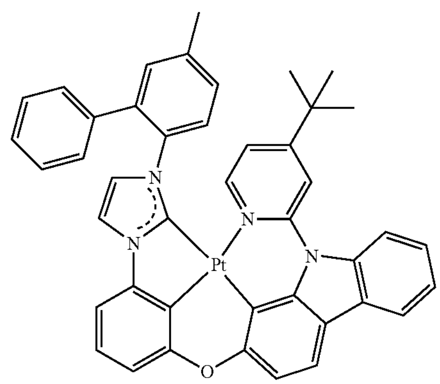

-continued
39
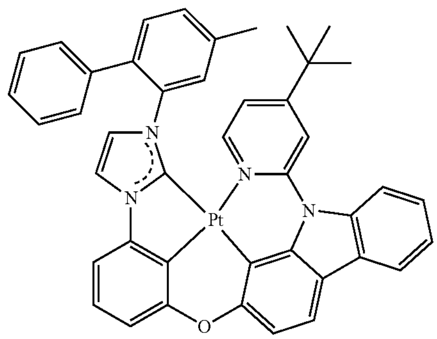
40
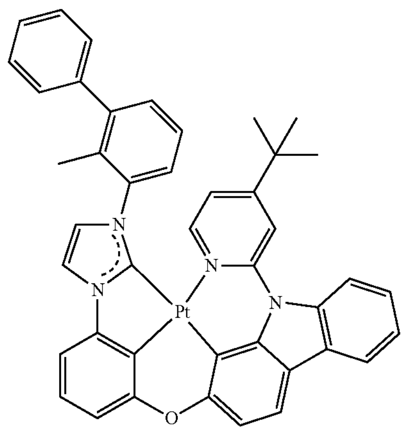
41
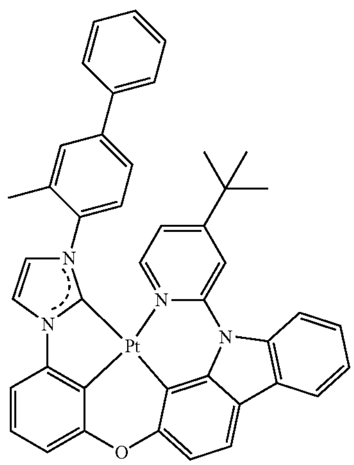
42
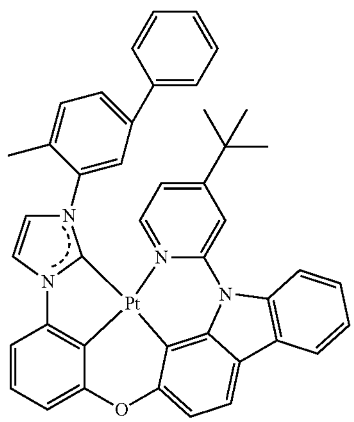
-continued
43
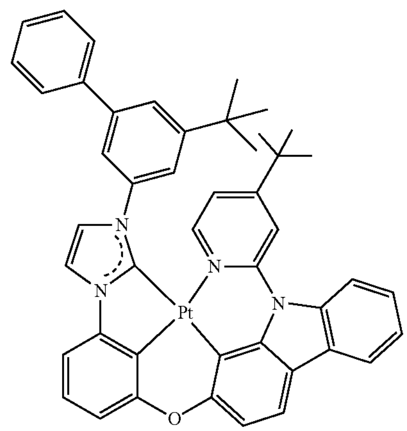
44
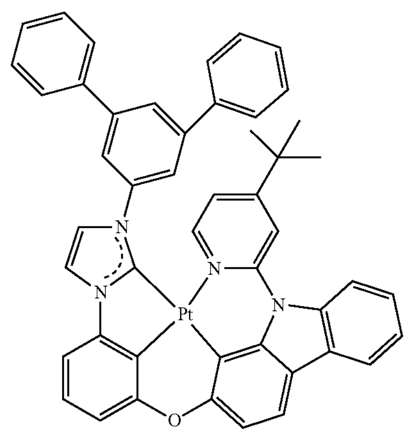
45
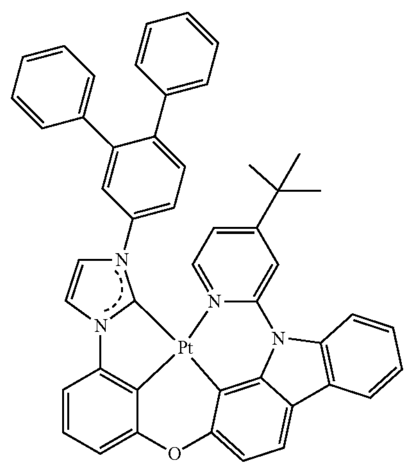

-continued
46
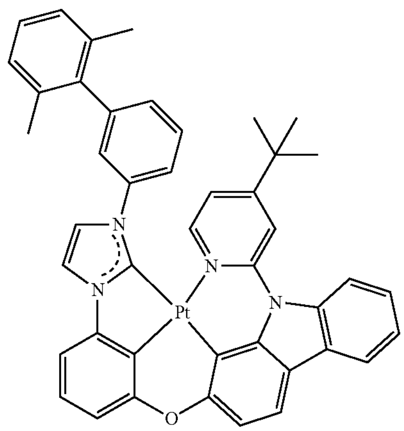
47
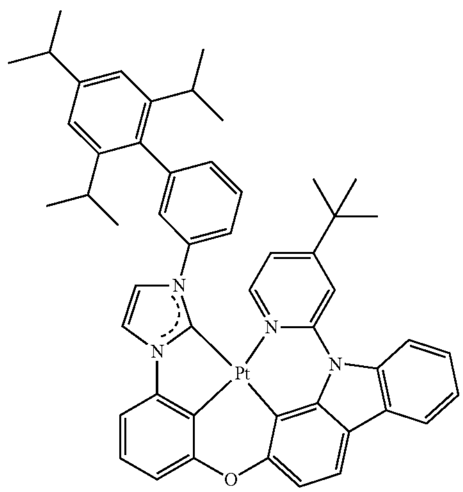
48
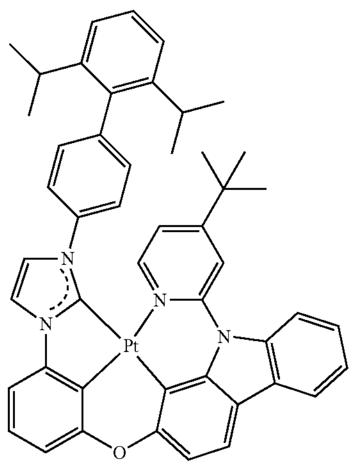
-continued
49
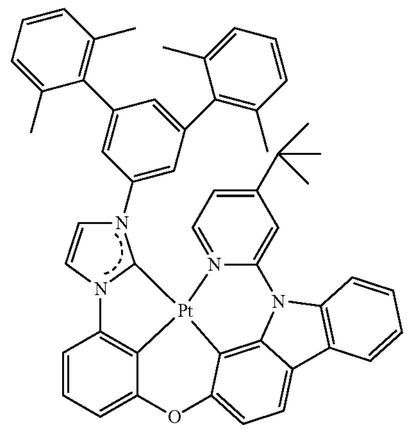
50
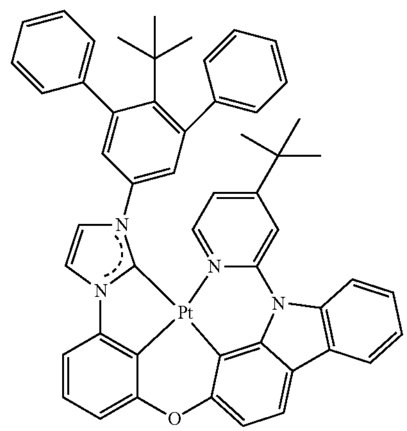
51
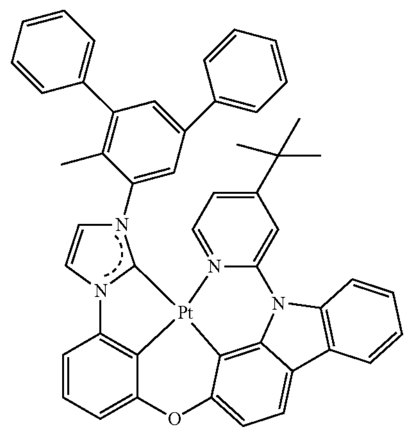

-continued
52
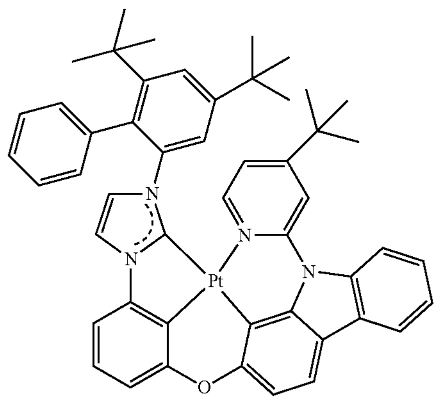
53
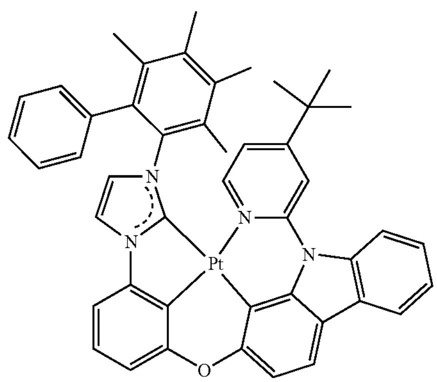
54
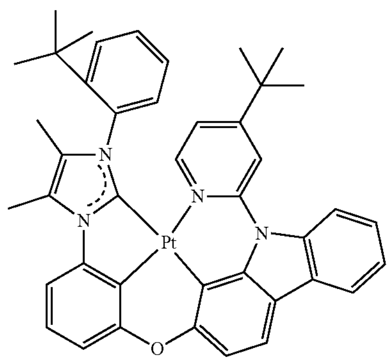
55
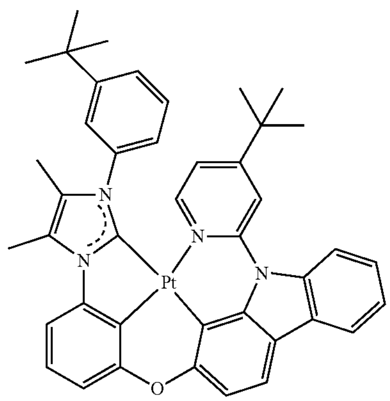
-continued
56
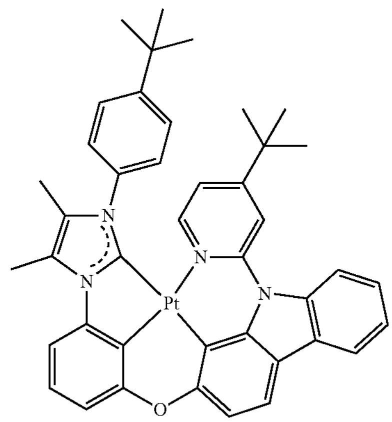
57
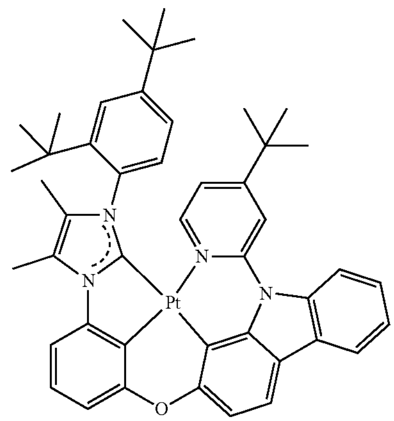
58
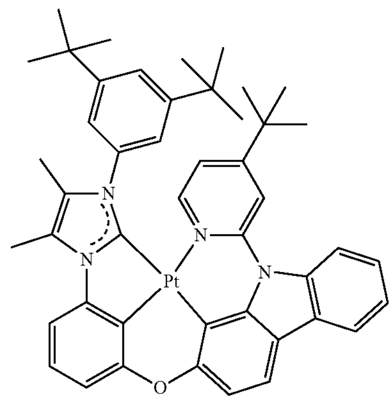
59
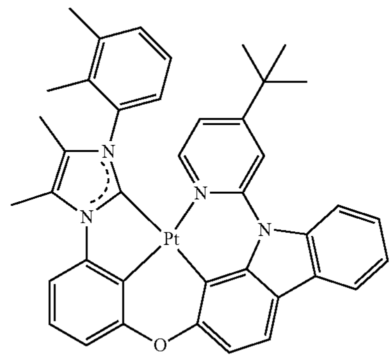

-continued
60
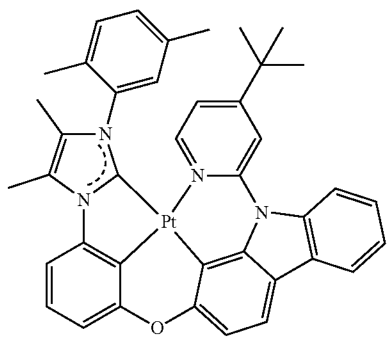
61
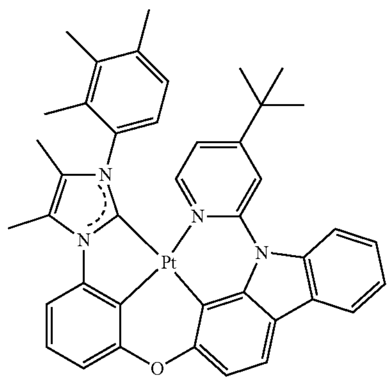
62
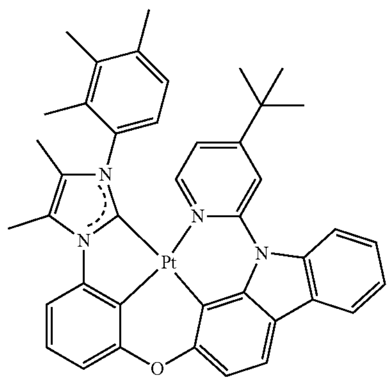
63
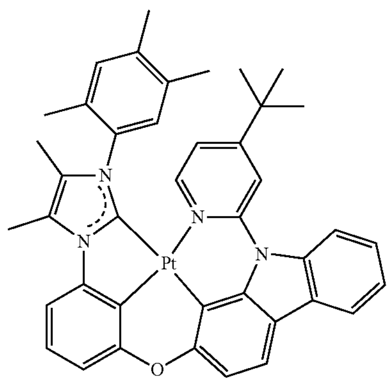
-continued
64
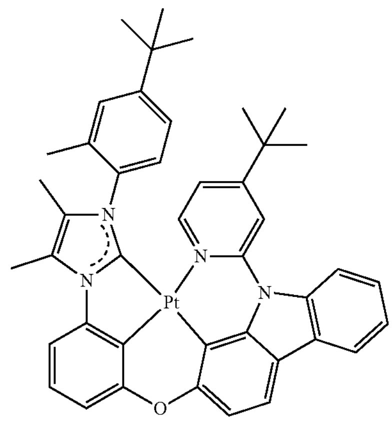
65
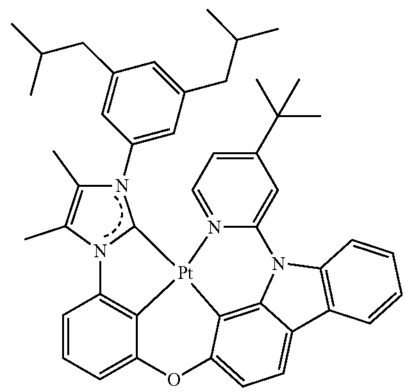
66
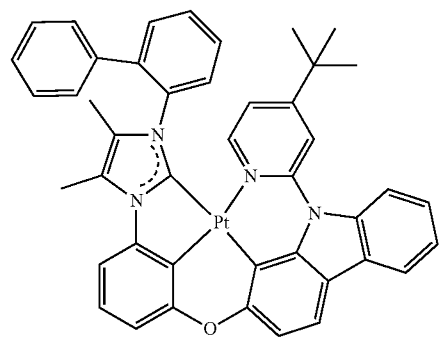
67
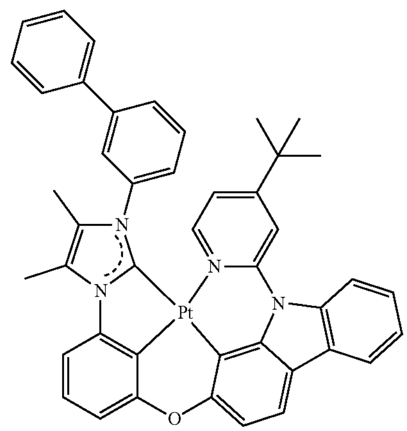

-continued
68
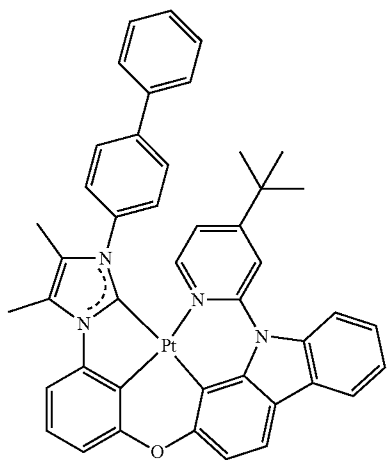
69
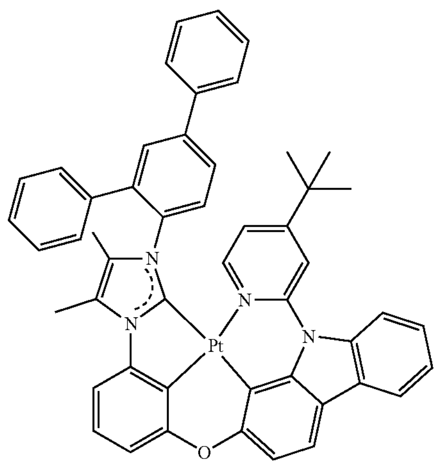
70
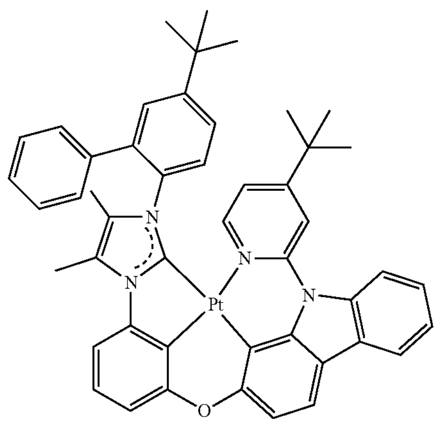
-continued
71
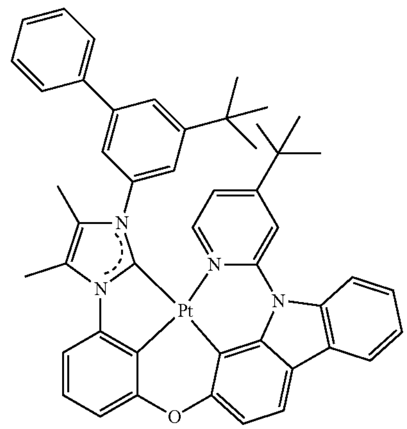
72
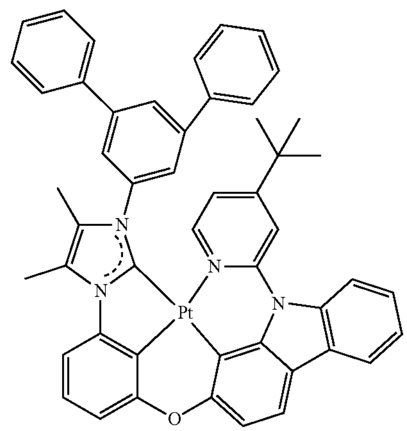
73
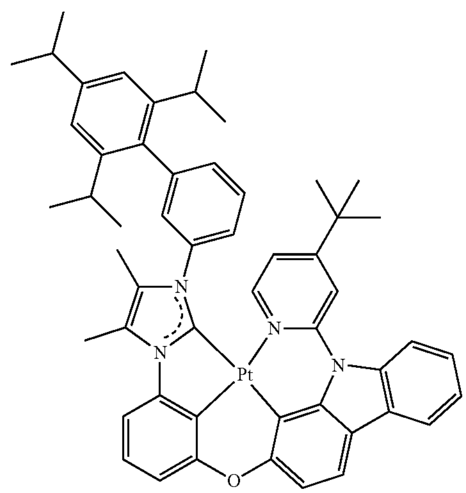

-continued
74
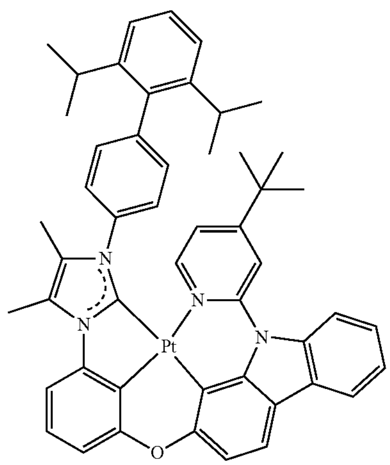
75
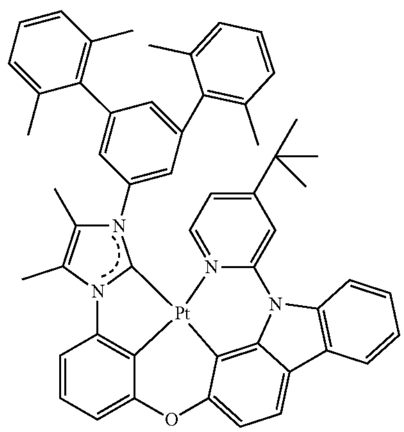
76
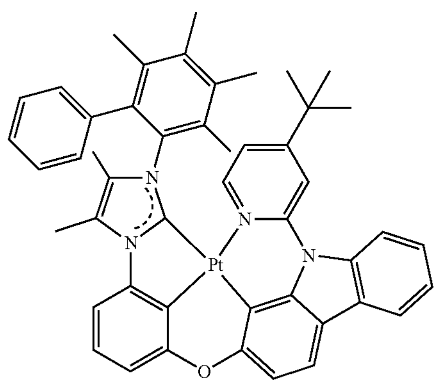
77
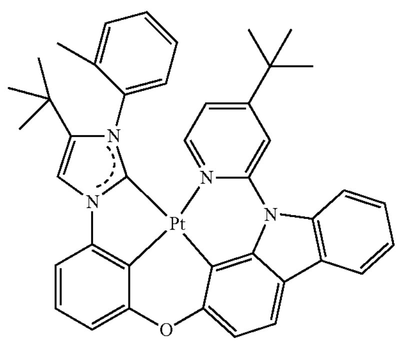
-continued
78
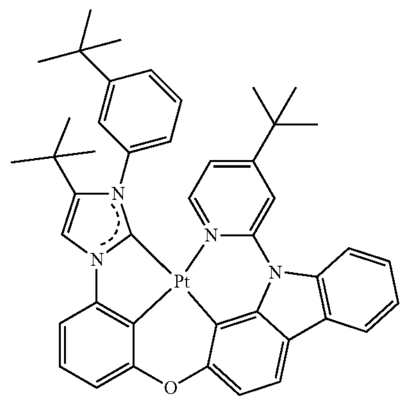
79
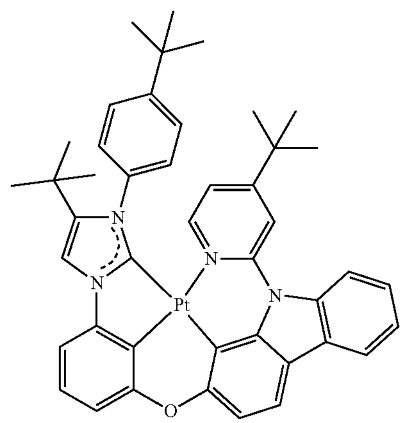
80
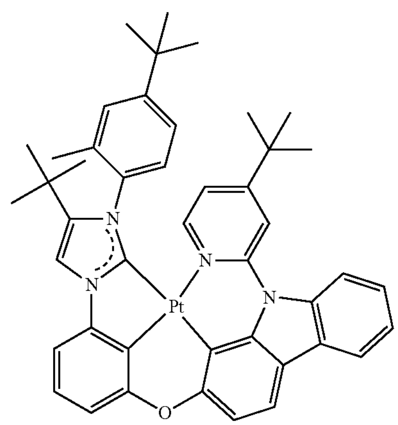
81
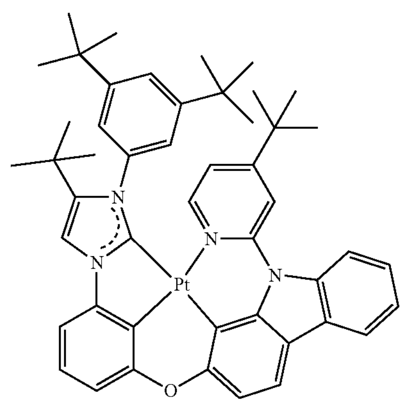

-continued
82
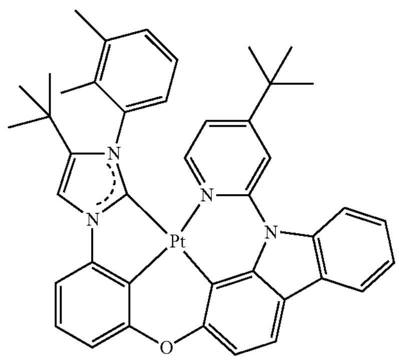
83
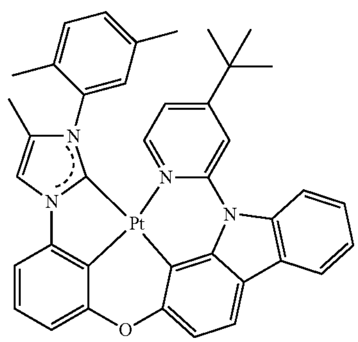
84
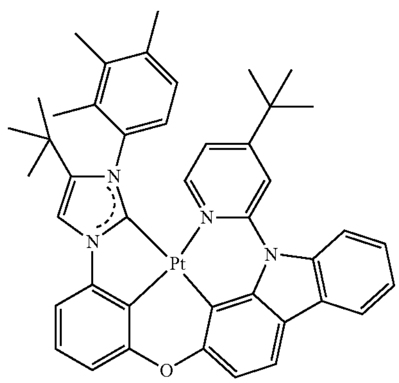
85
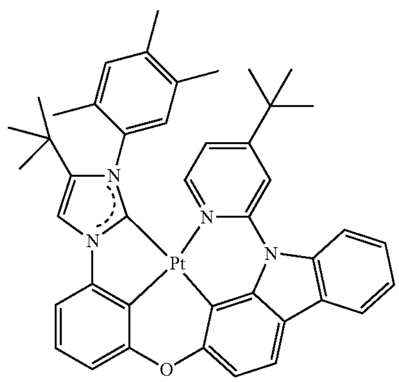
-continued
86
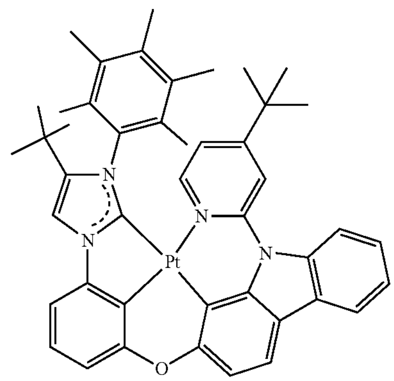
87
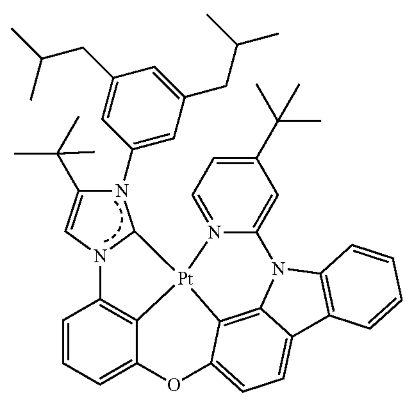
88
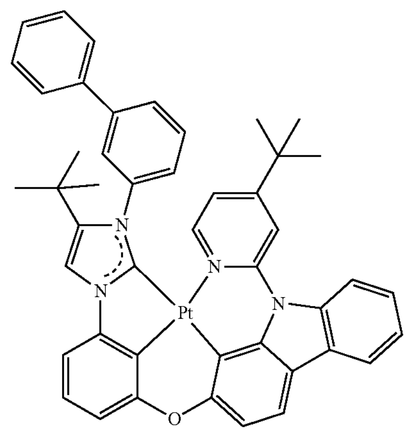
89
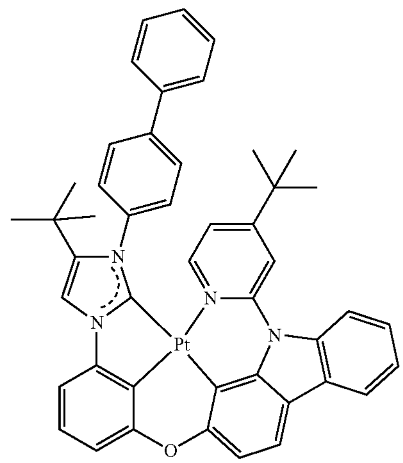

90
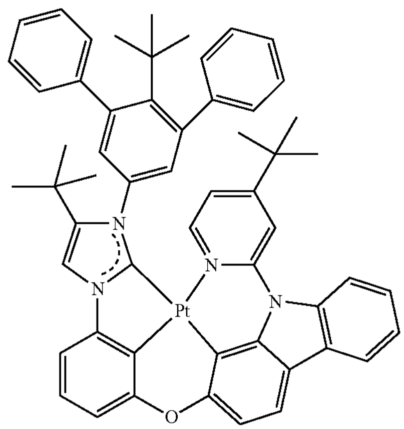
91
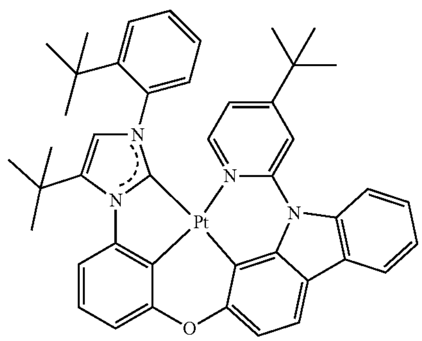
92
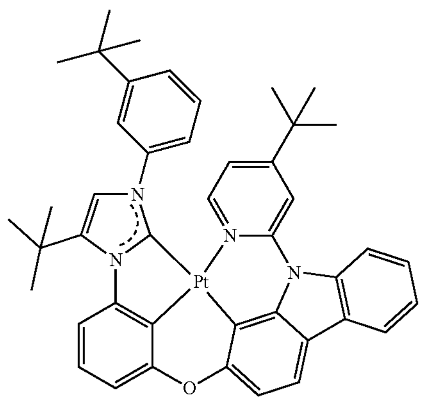
93
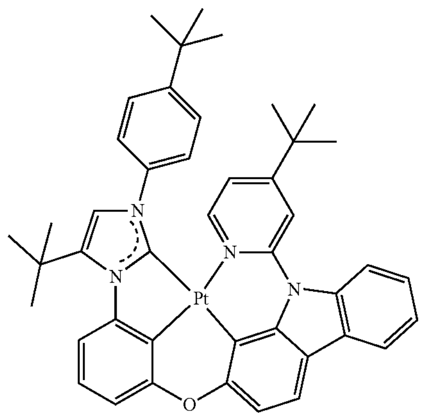
94
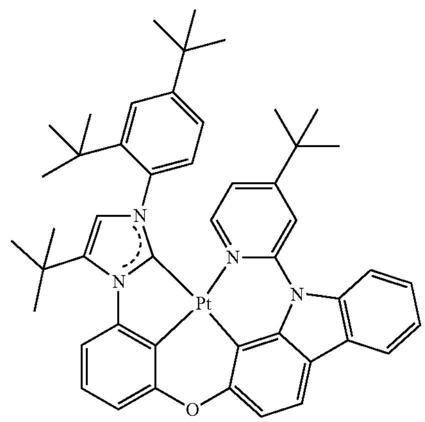
95
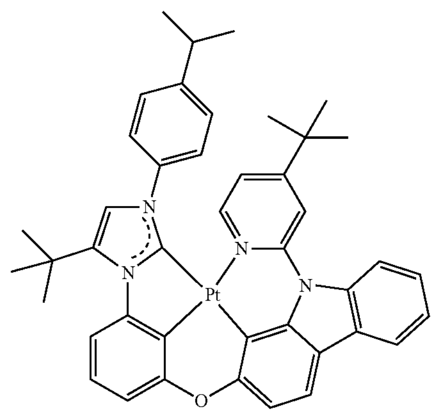
96
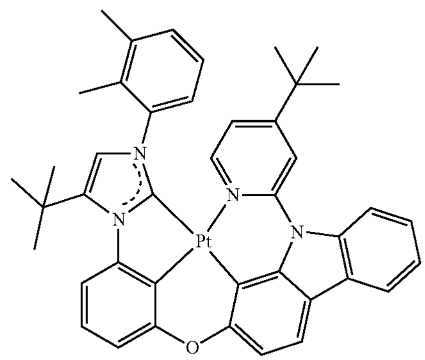
97
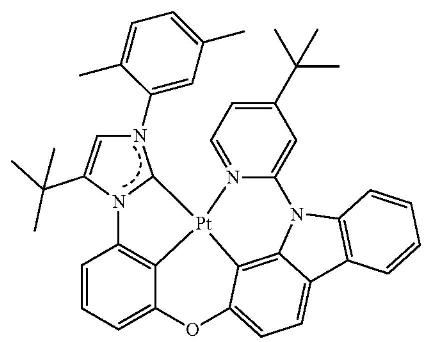

-continued
98
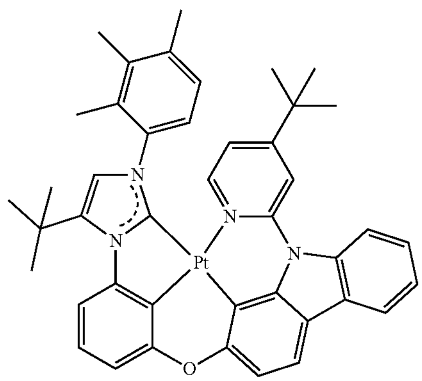
99
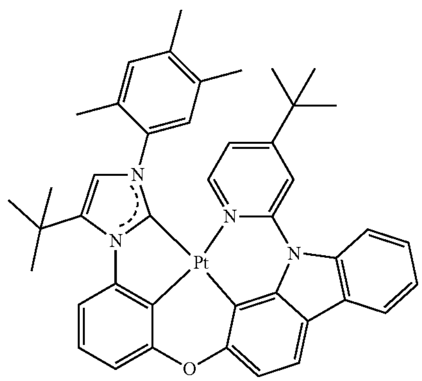
100
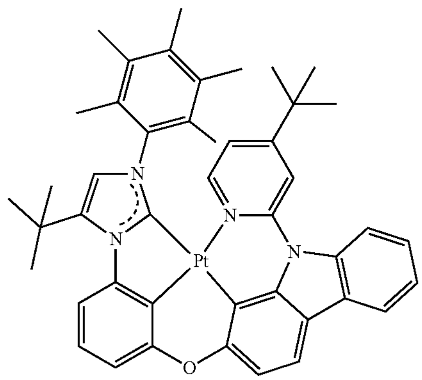
101
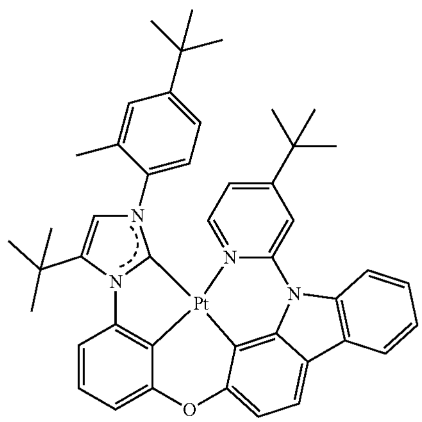
-continued
102
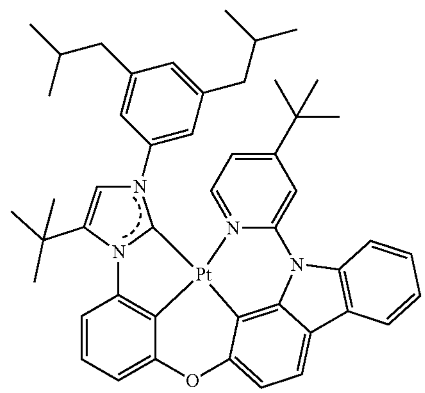
103
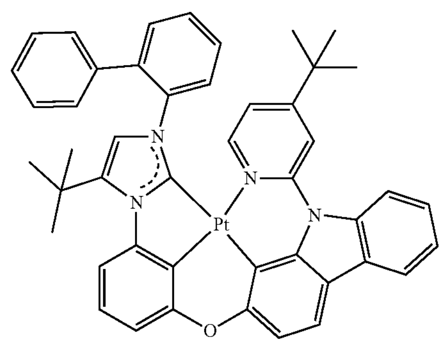
104
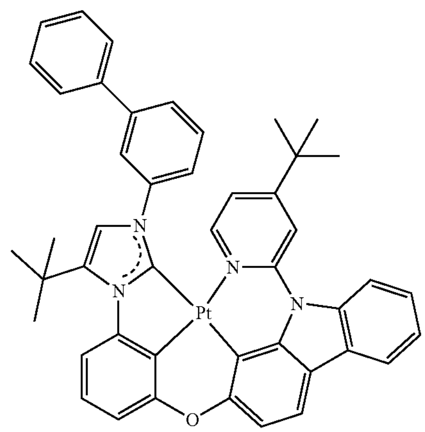
105
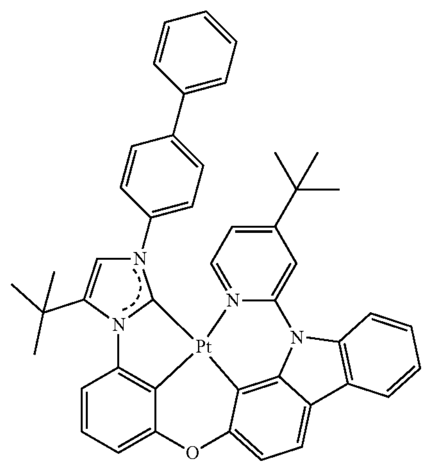

106
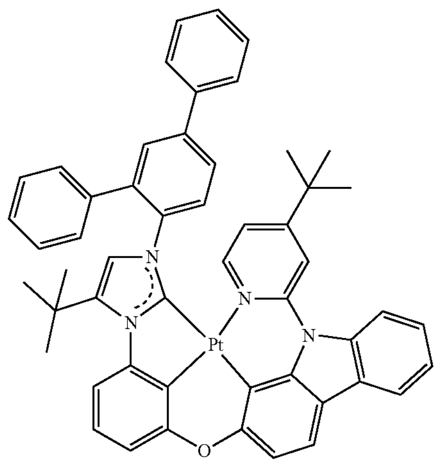
107
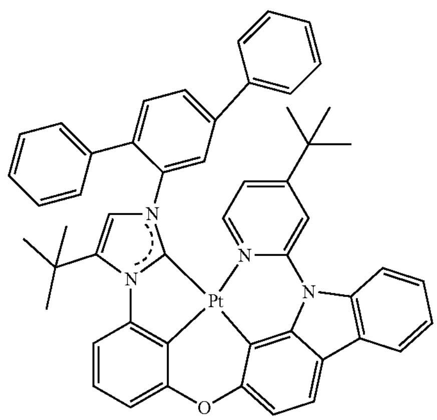
108
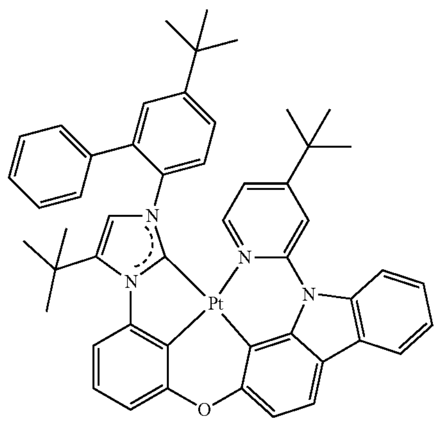
109
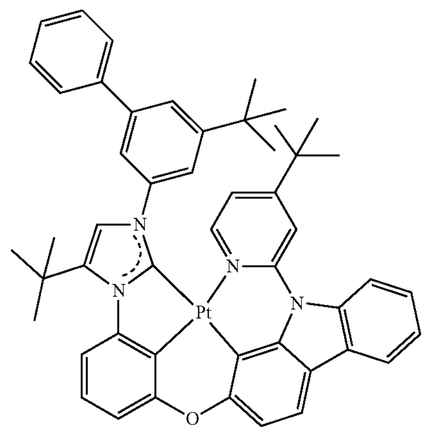
110
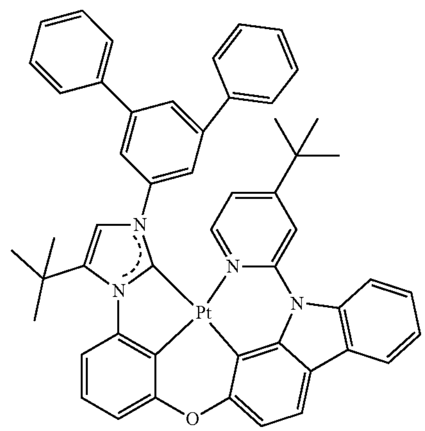
111
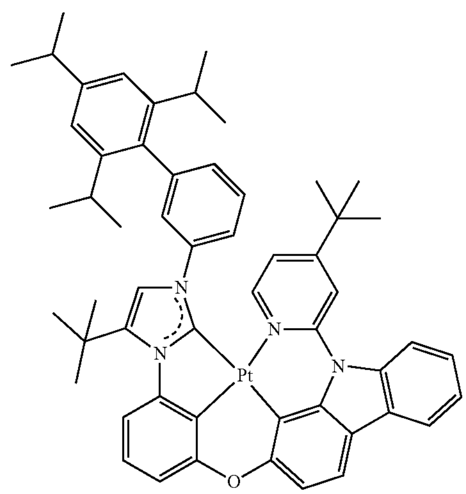

-continued
112
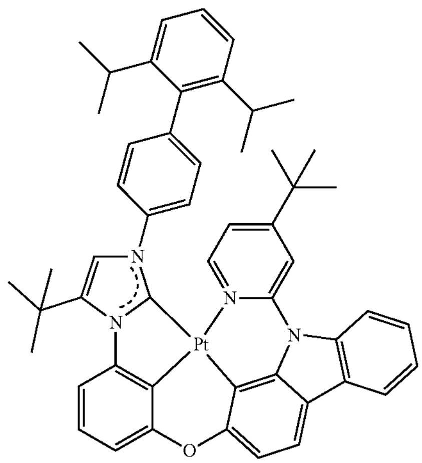
113
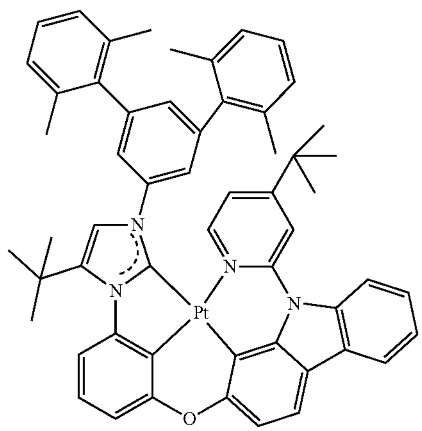
114
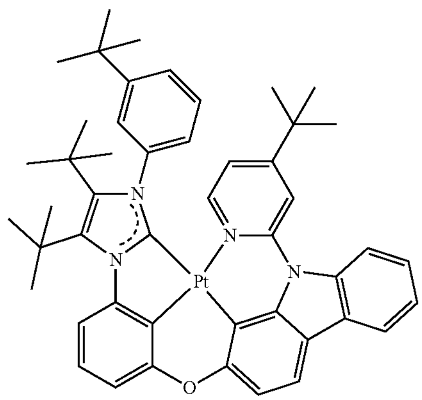
-continued
115
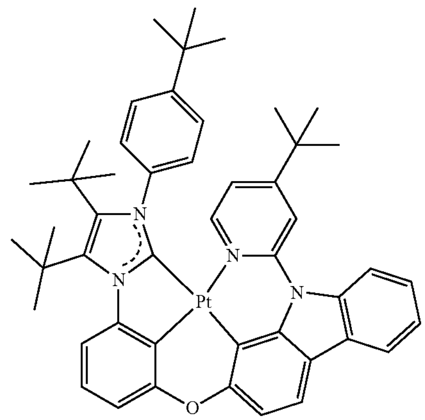
116
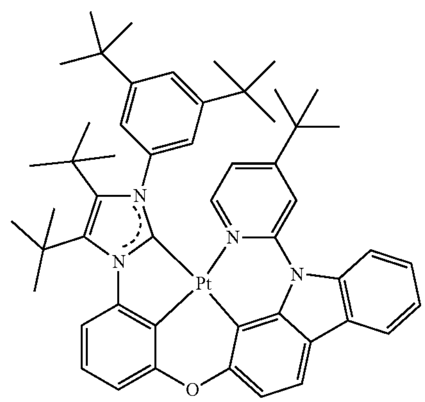
117
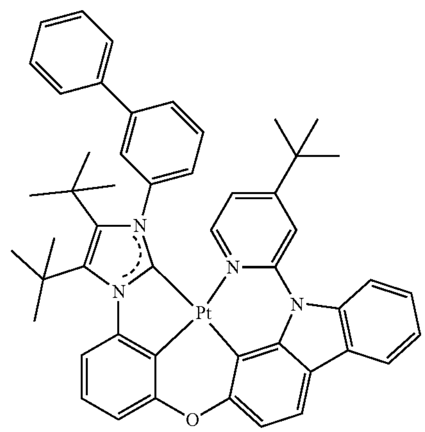

-continued
118
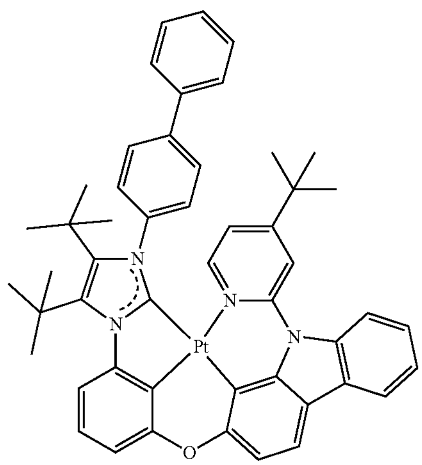
119
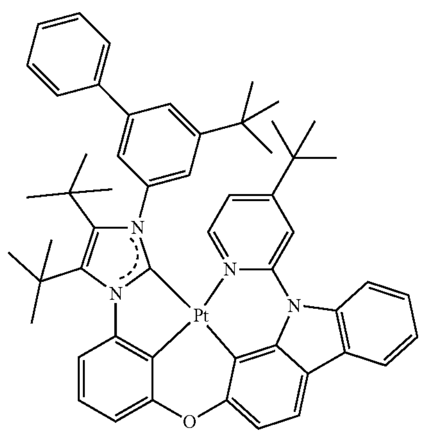
120
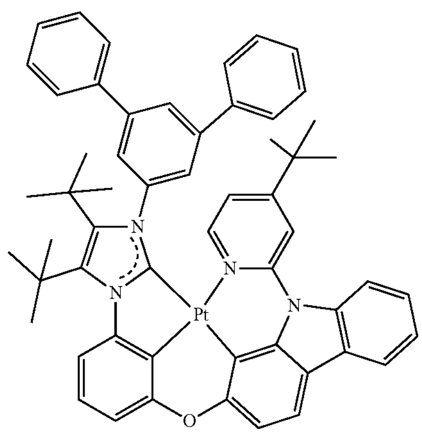
121
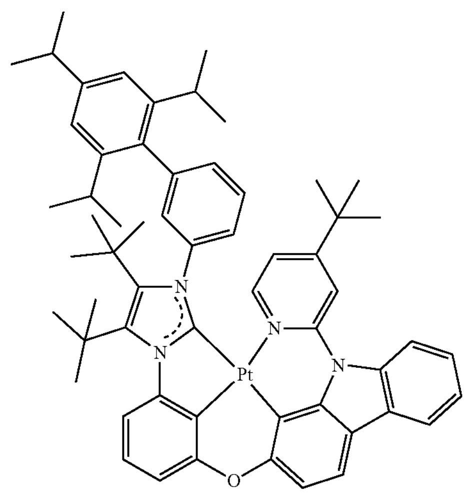
122
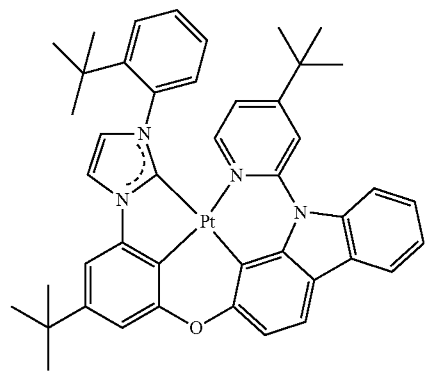
123
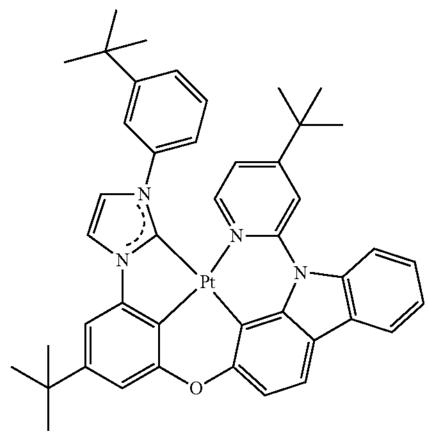

124
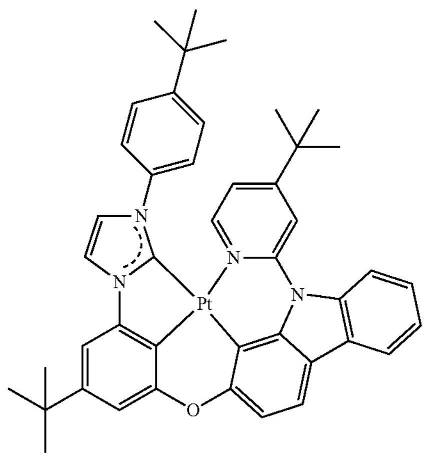
125
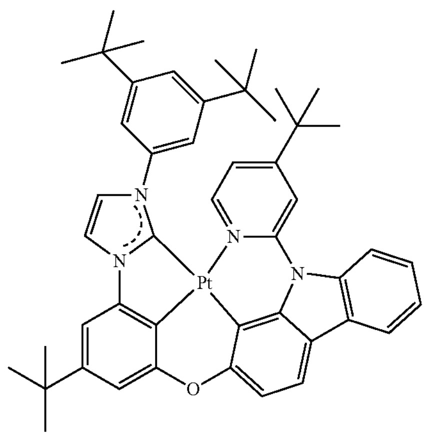
126
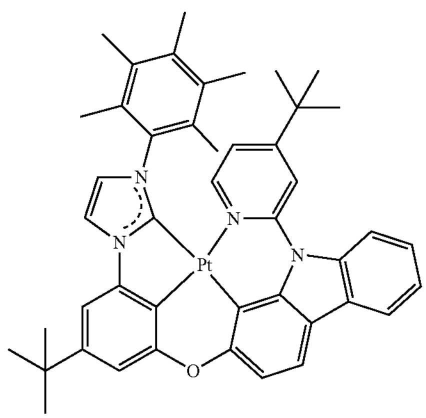
127
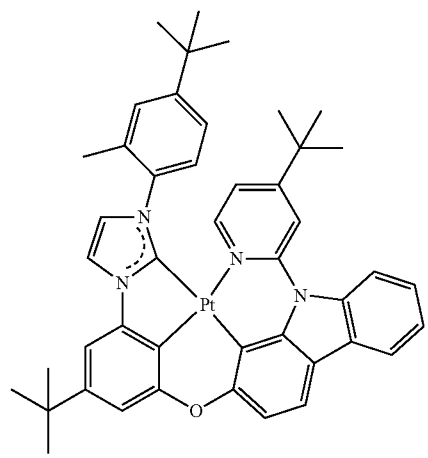
128
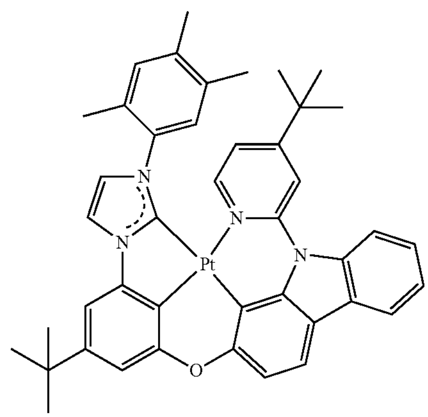
129
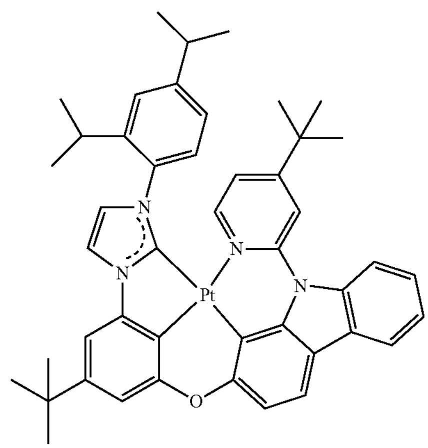

-continued
130
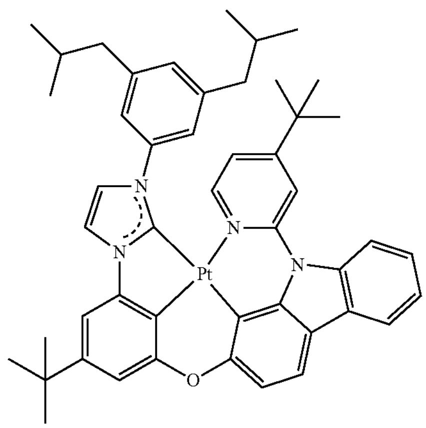
131
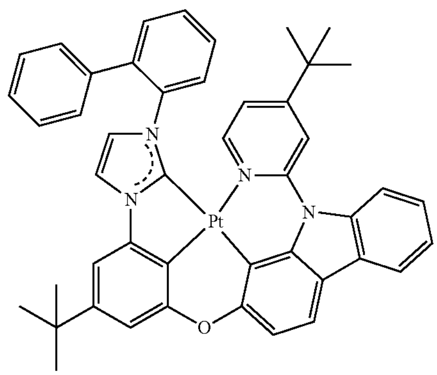
132
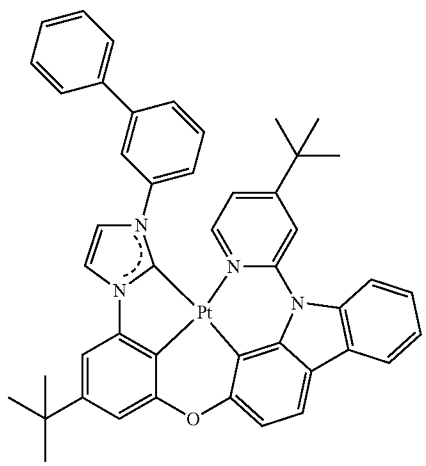
-continued
133
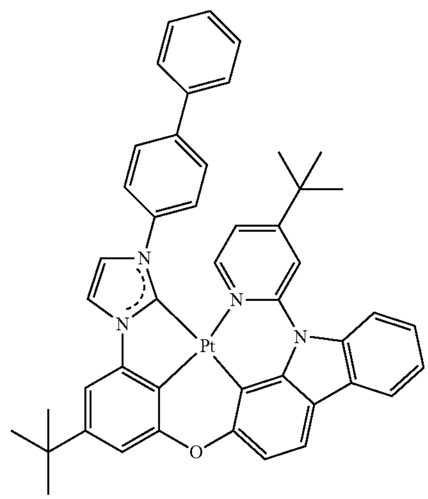
134
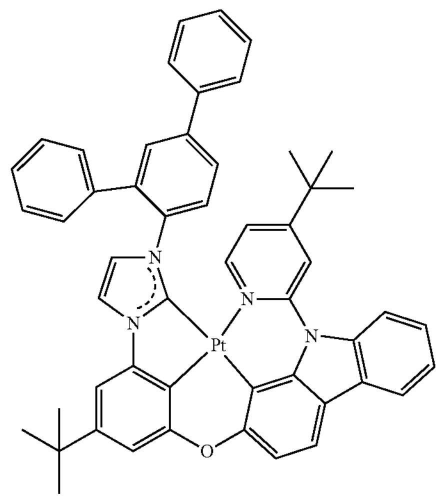
135
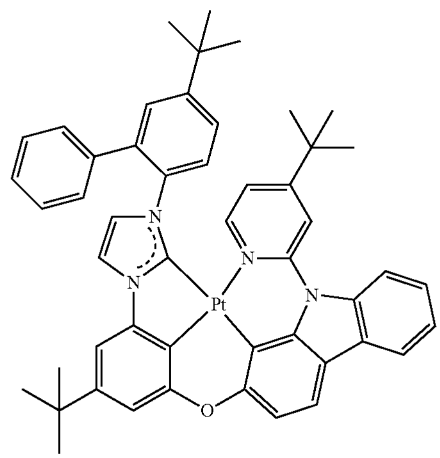

-continued
136
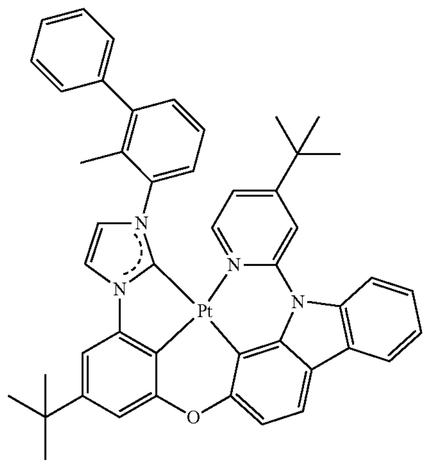
137
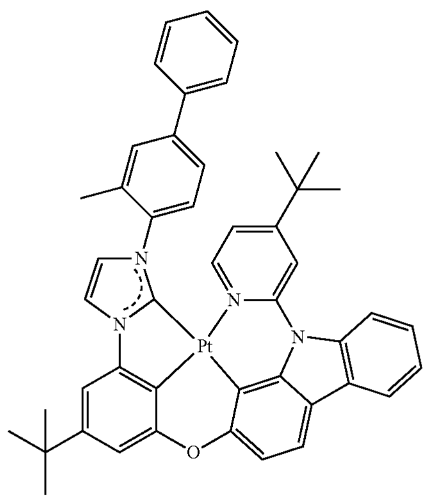
138
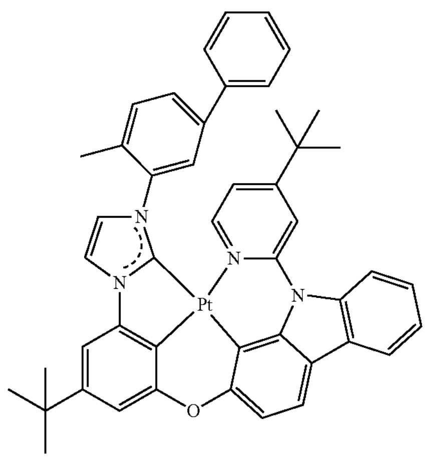
-continued
139
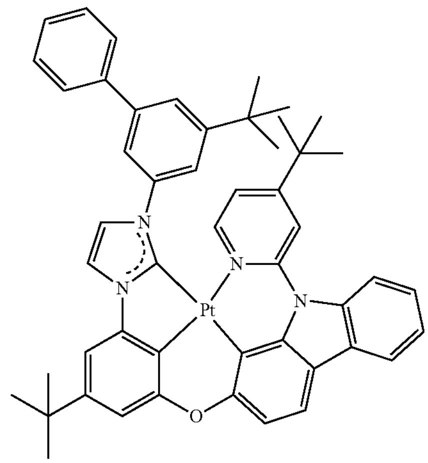
140
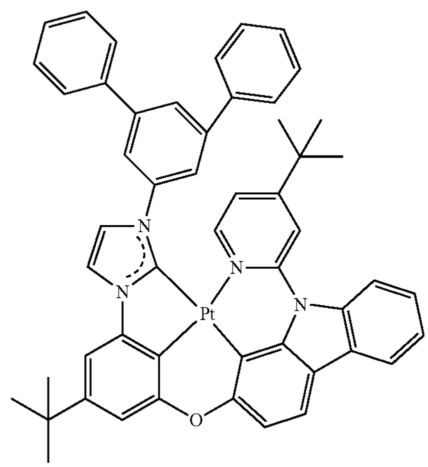
141
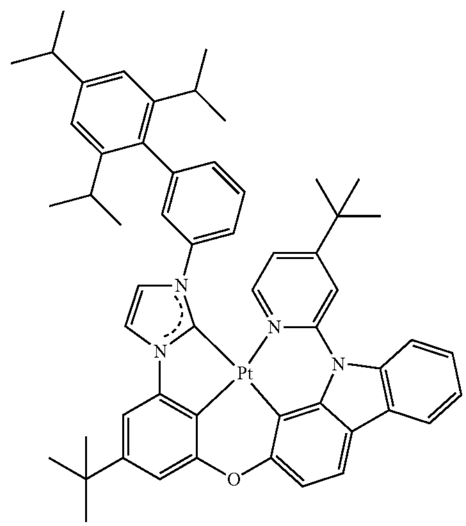

-continued
142
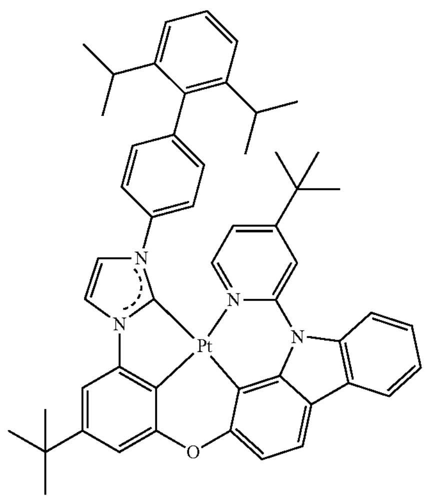
143
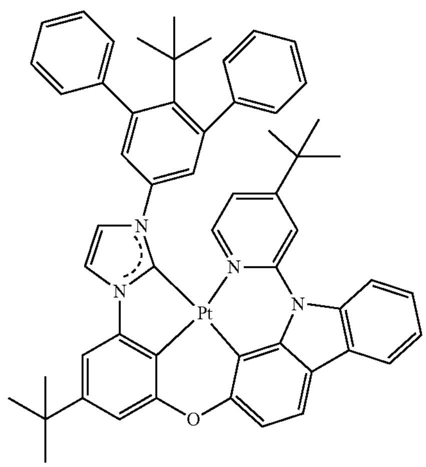
144
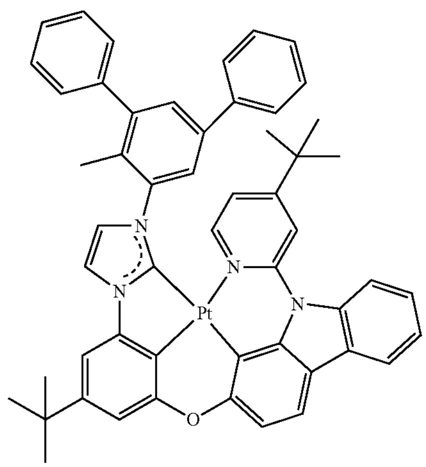
-continued
145
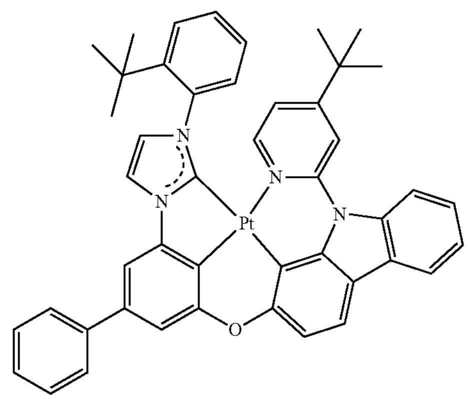
146
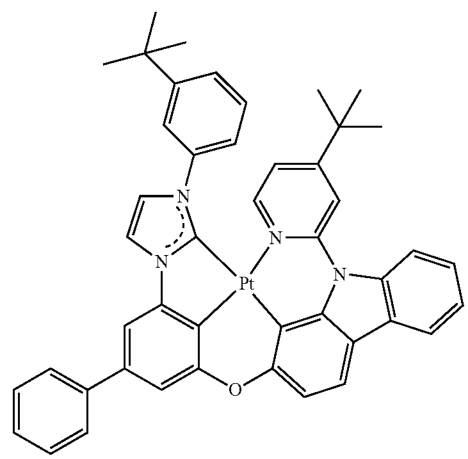
147
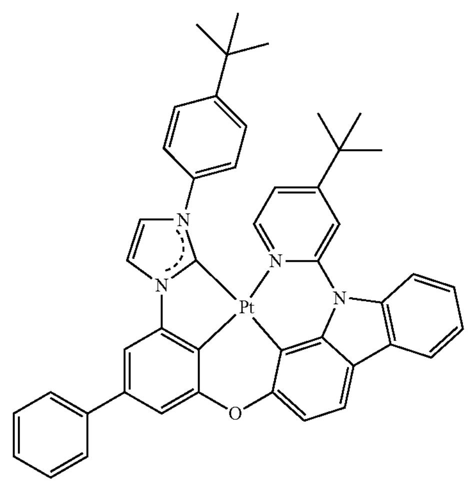

-continued
148
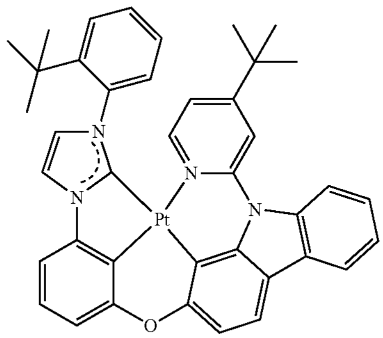
149
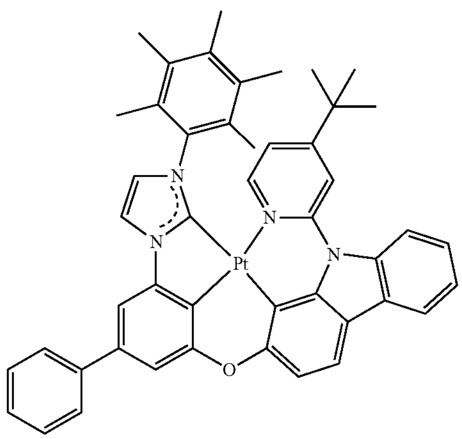
150
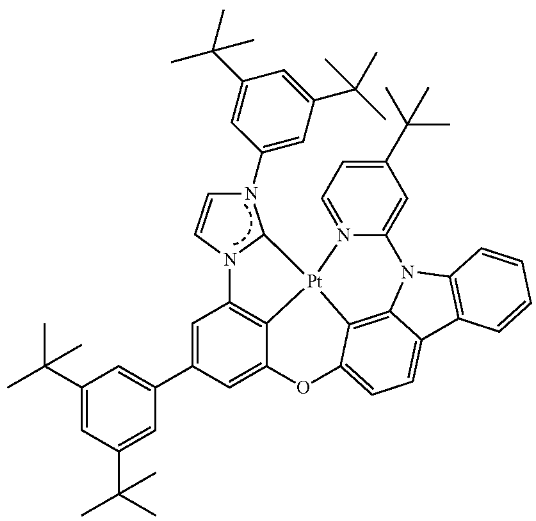
-continued
151
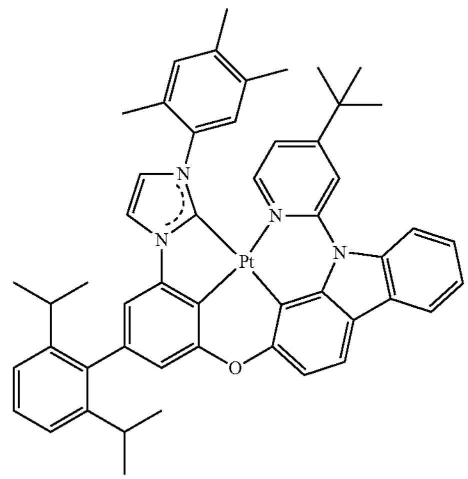
152
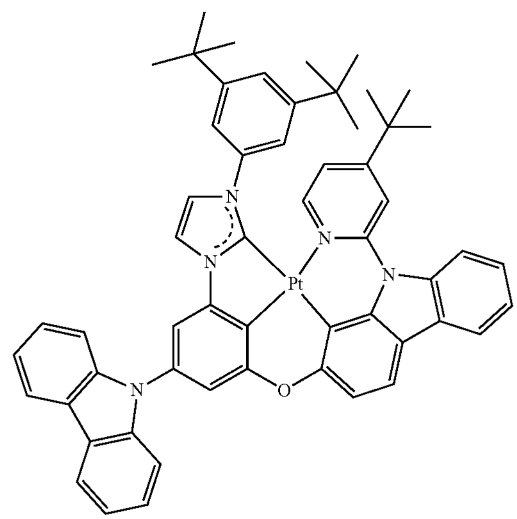
153
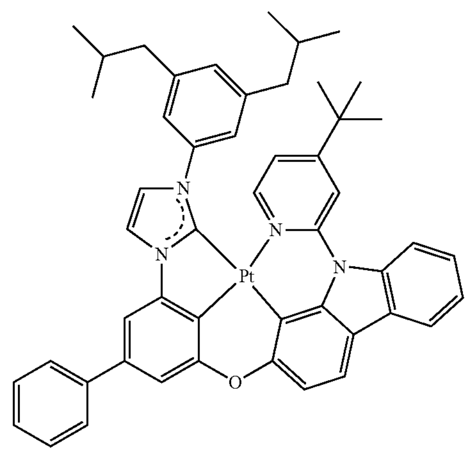

-continued
154
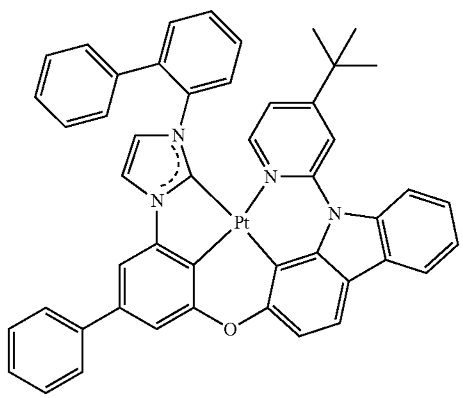
155
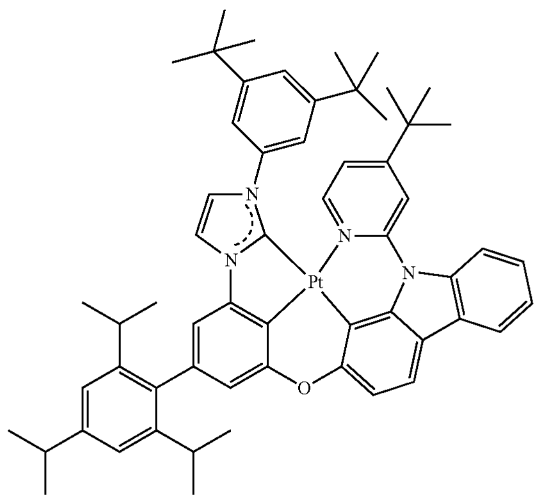
156
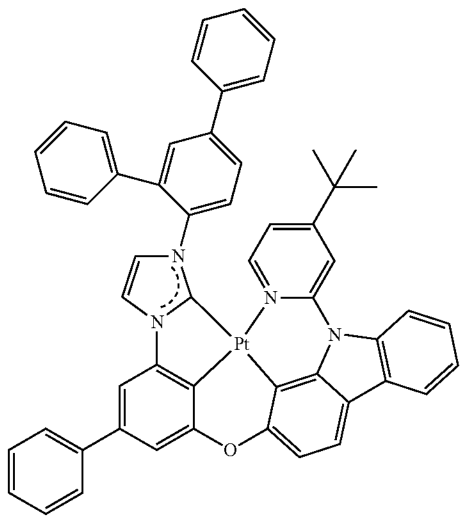
-continued
157
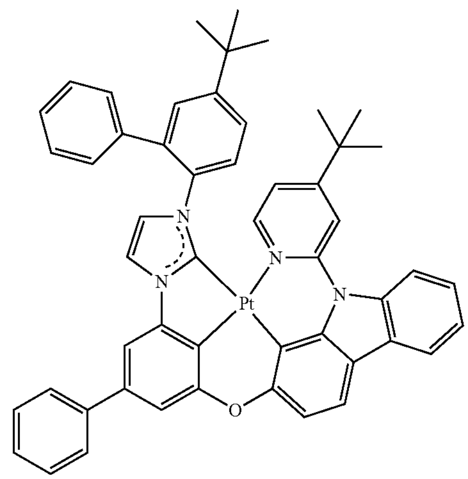
158
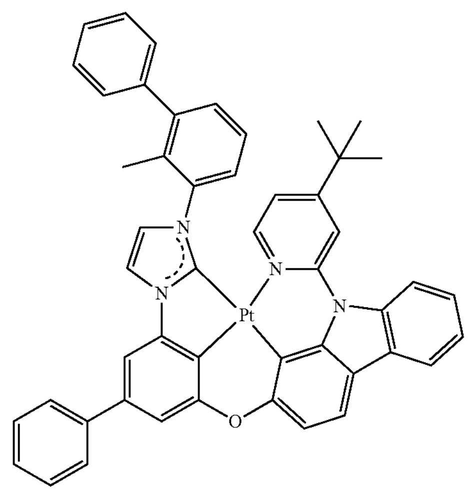
159
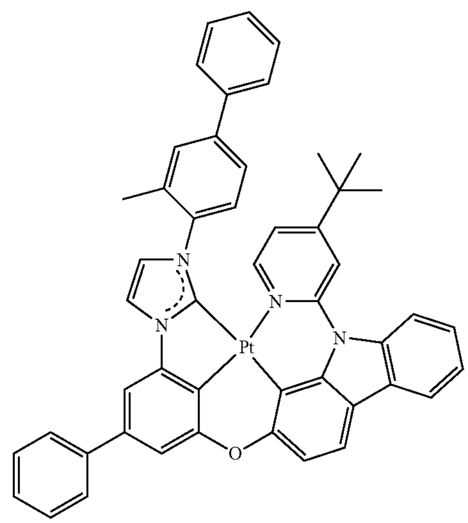

-continued
160
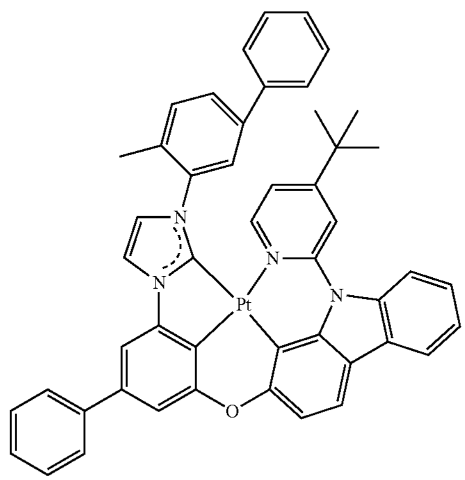
161
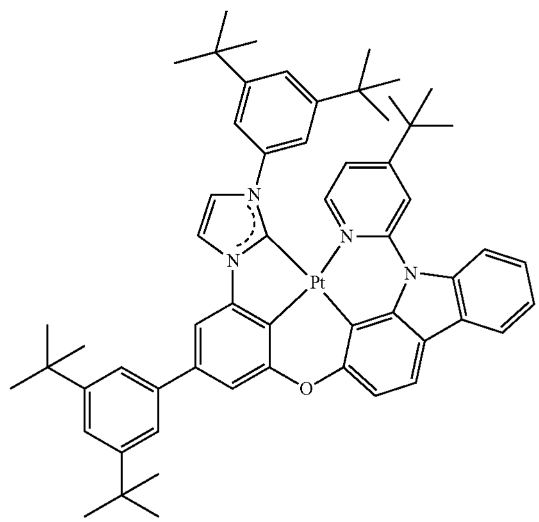
162
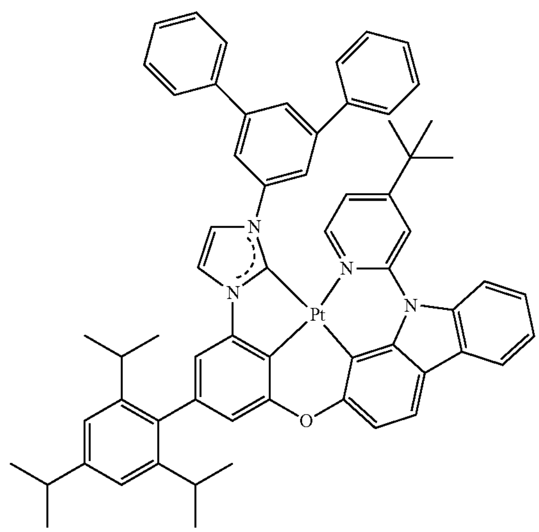
-continued
163
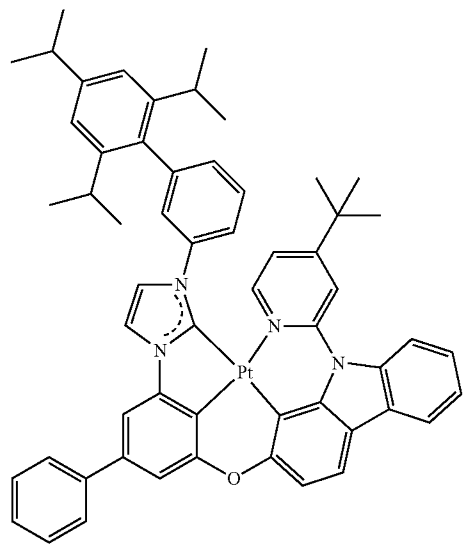
164
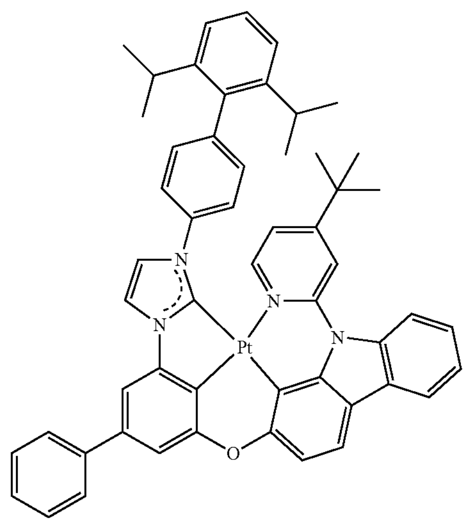
165
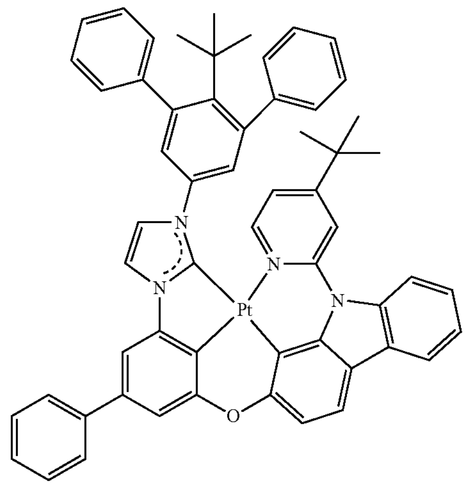

-continued
166
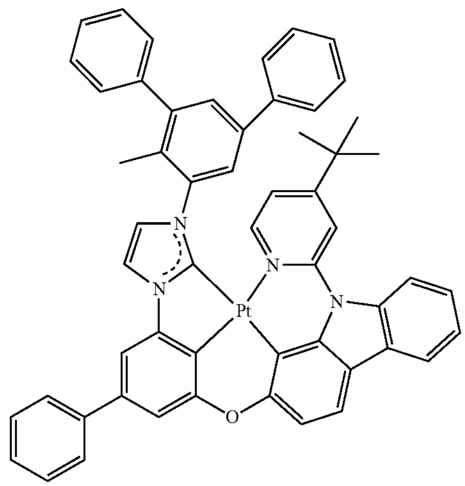
167
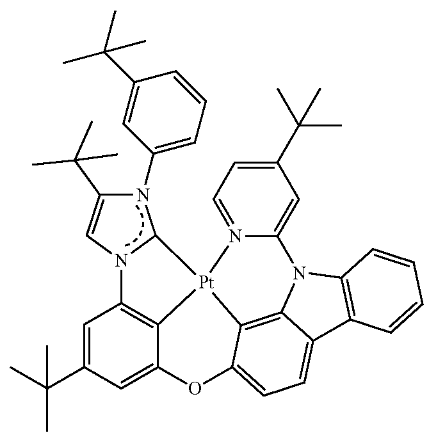
168
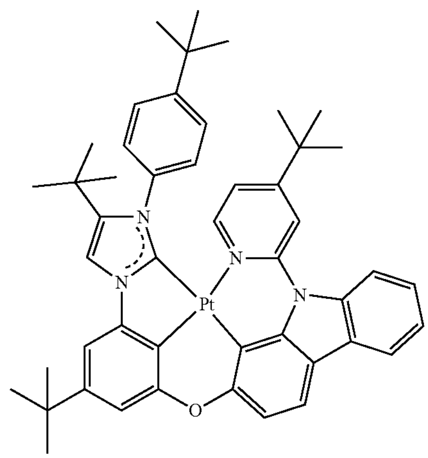
-continued
169
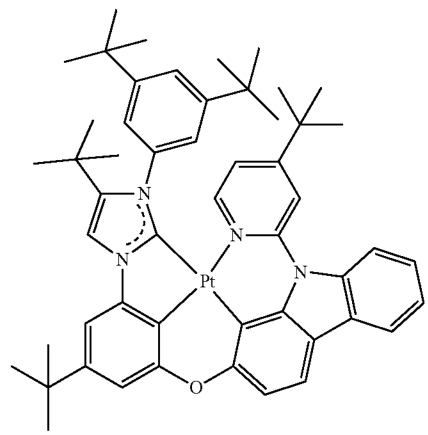
170
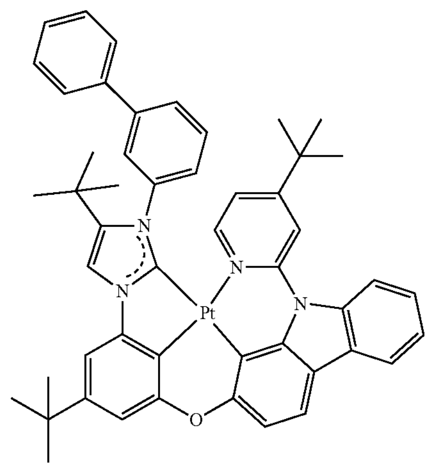
171
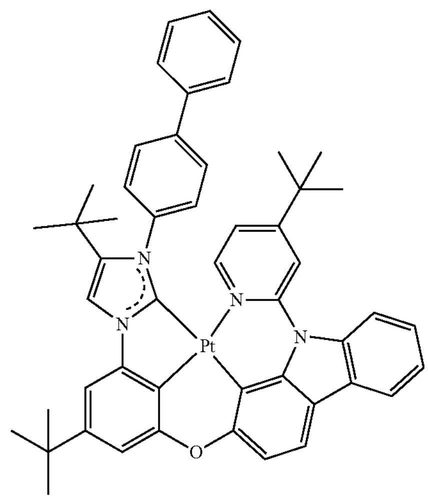

-continued
172
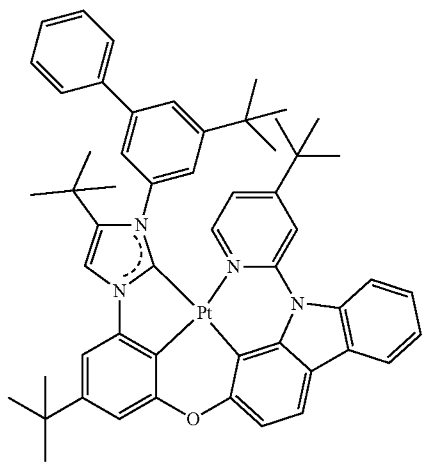
173
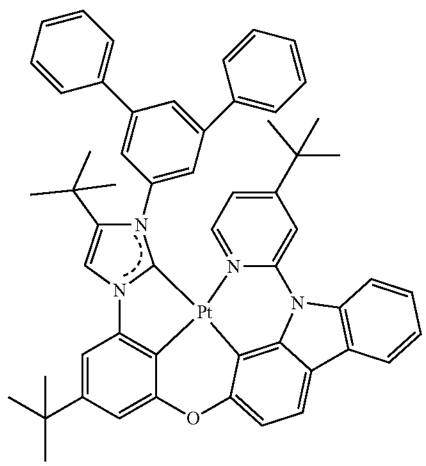
174
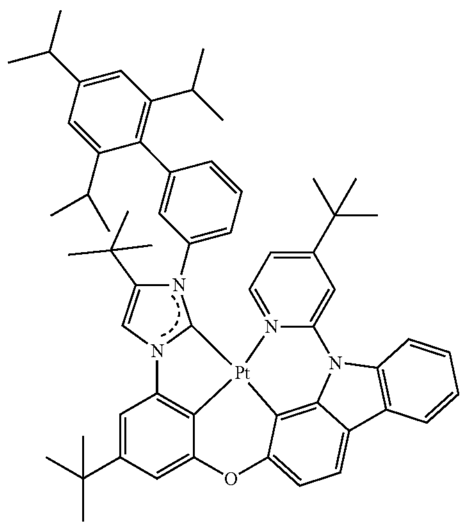
-continued
175
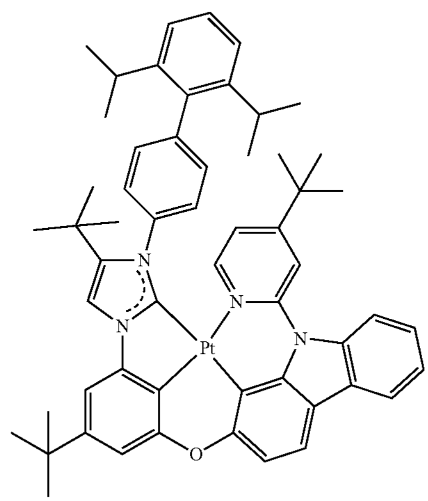
176
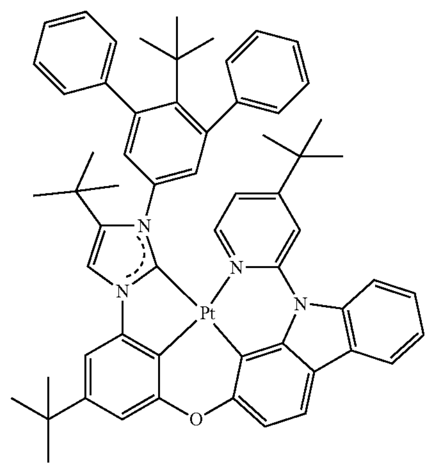
177
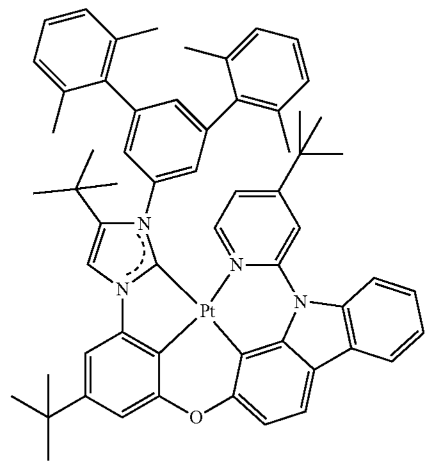

-continued
178
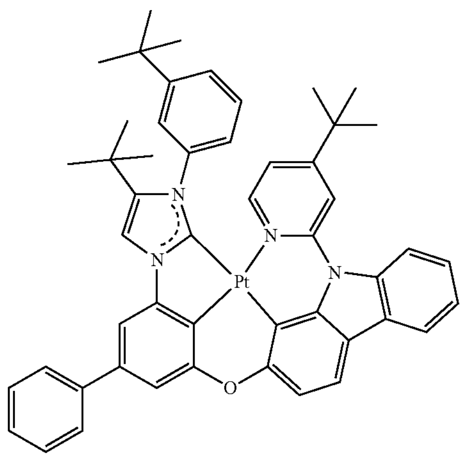
179
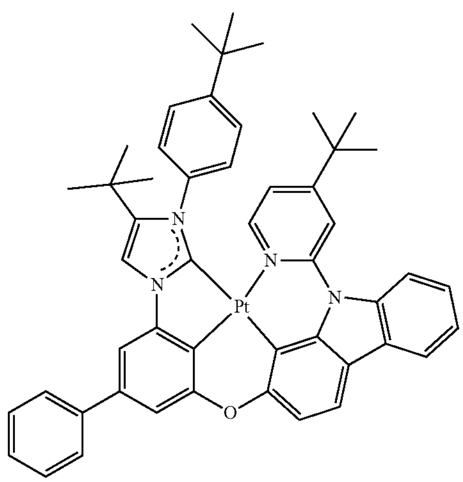
180
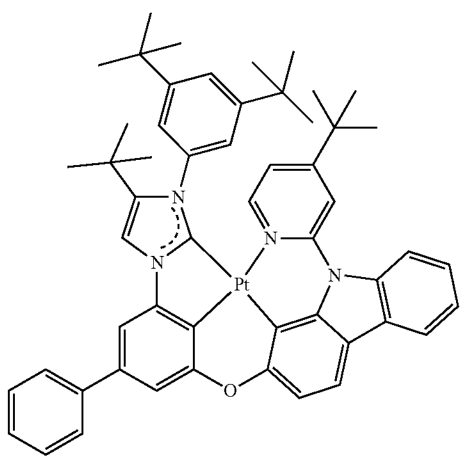
-continued
181
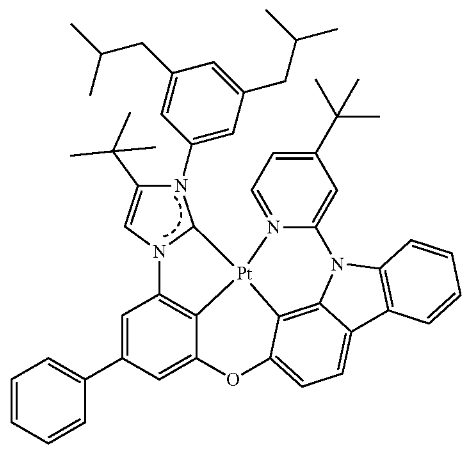
182
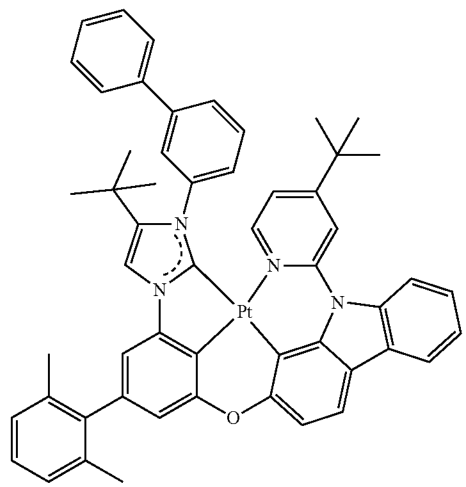
183
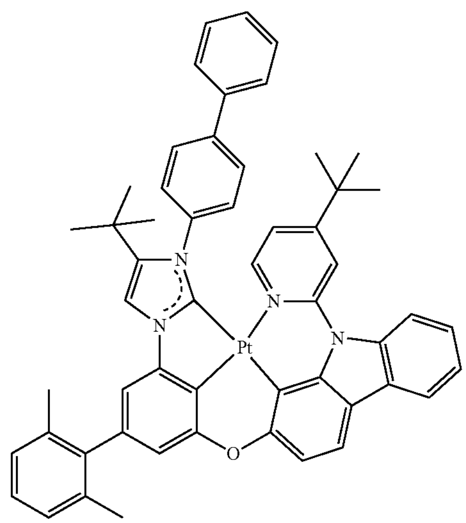

-continued
184
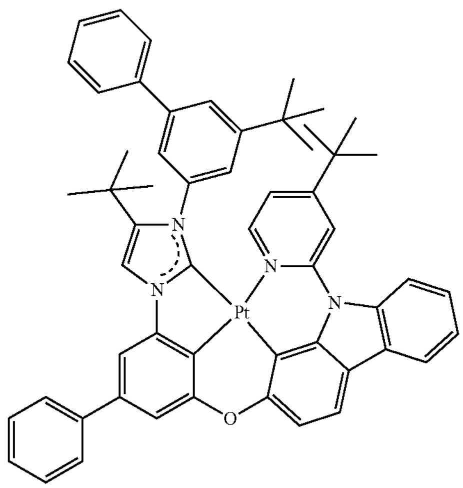
185
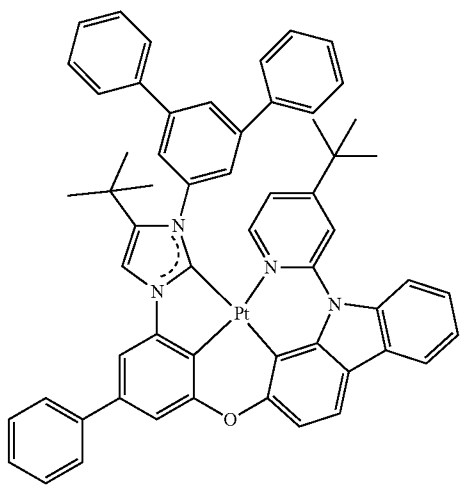
186
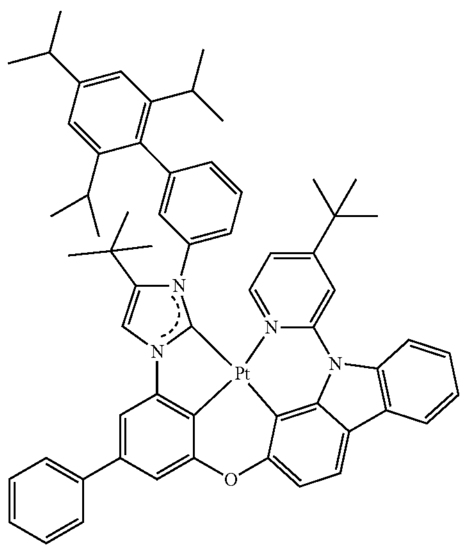
-continued
187
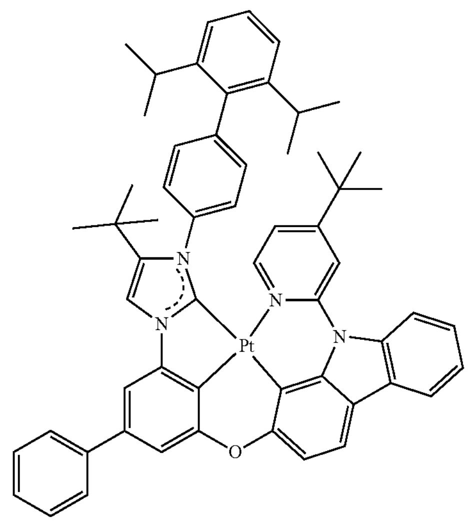
188
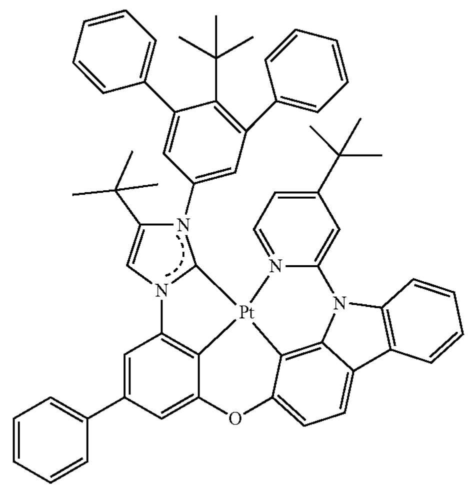
189
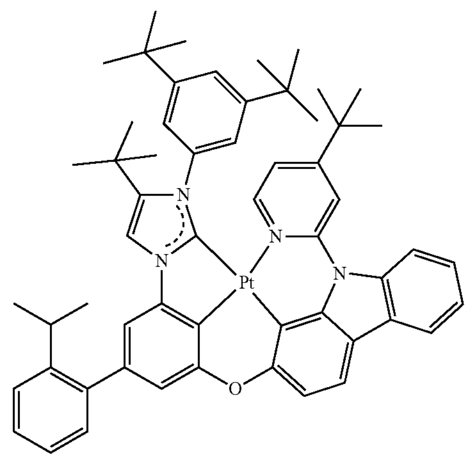

-continued
190
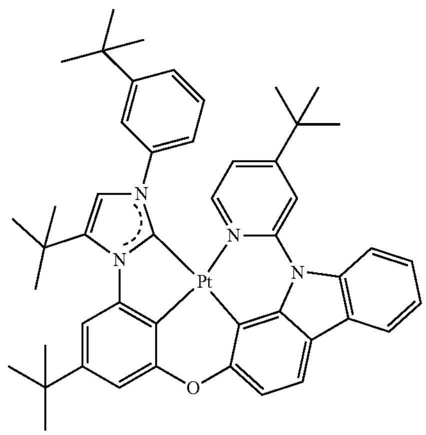
191
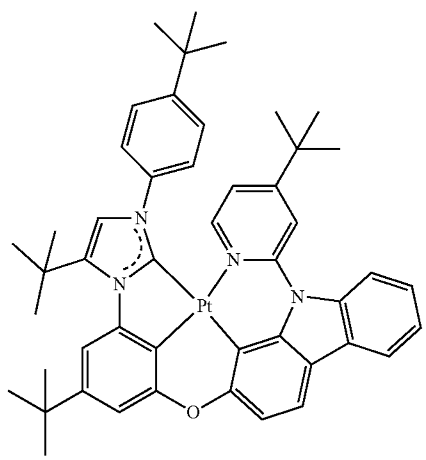
192
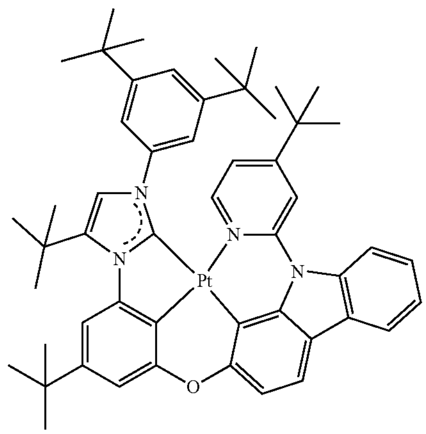
-continued
193
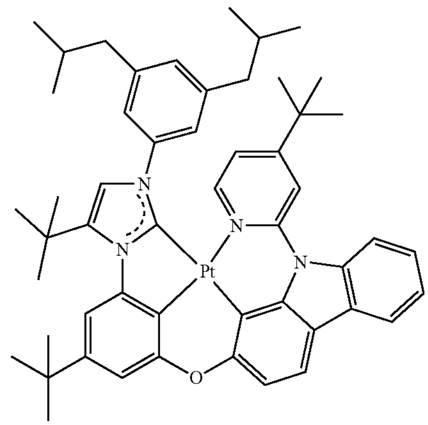
194
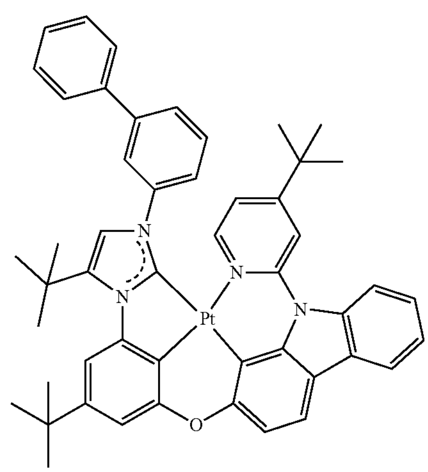
195
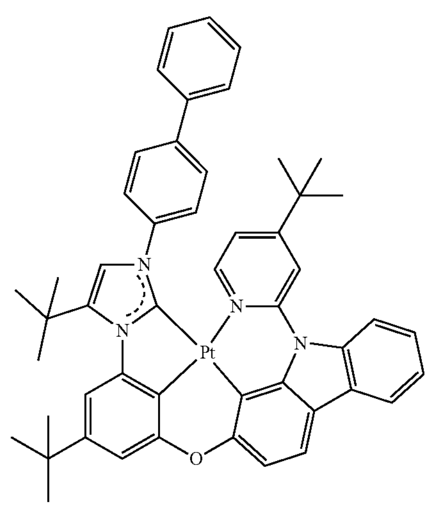

-continued
196
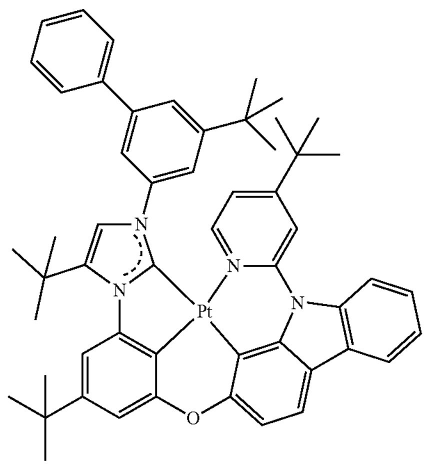
197
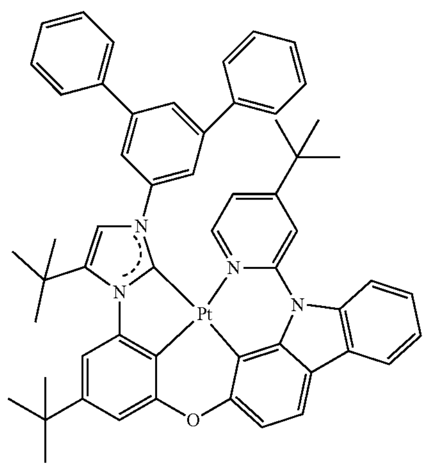
198
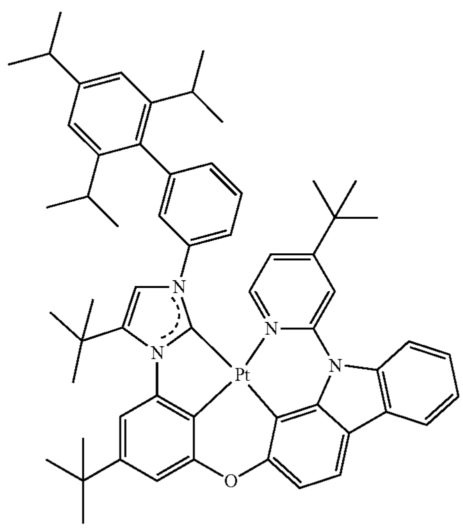
-continued
199
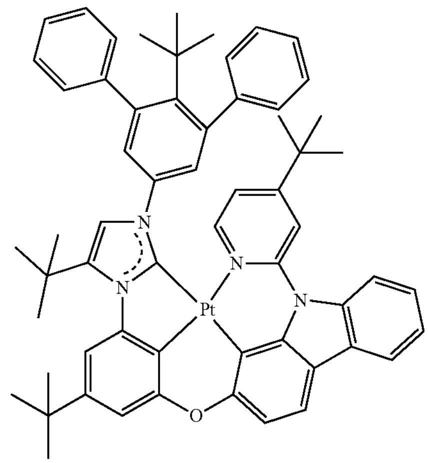
200
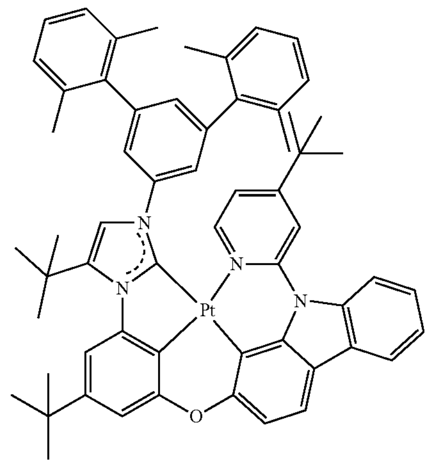
201
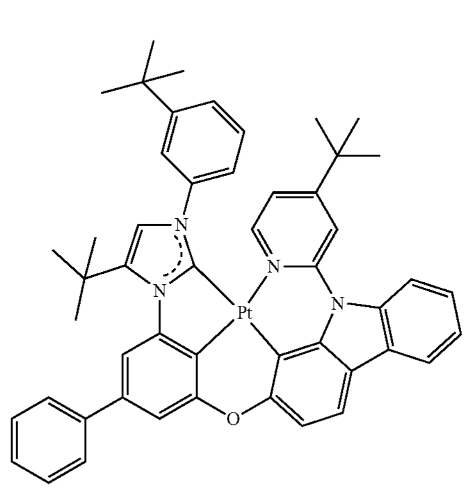

-continued
202
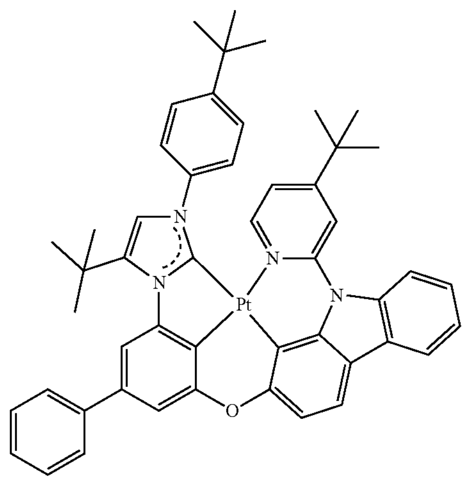
203
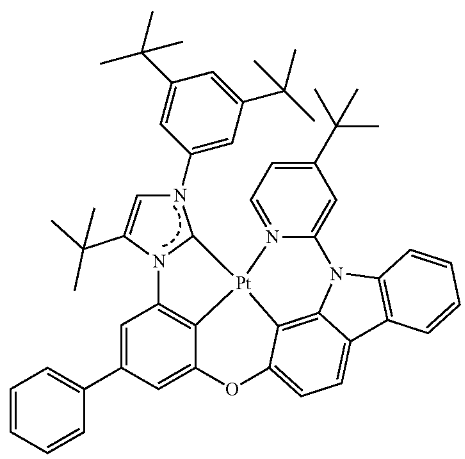
204
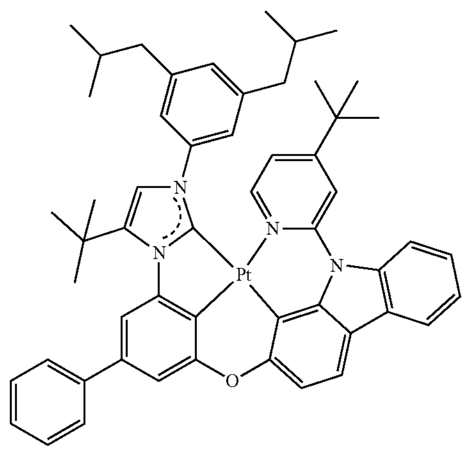
-continued
205
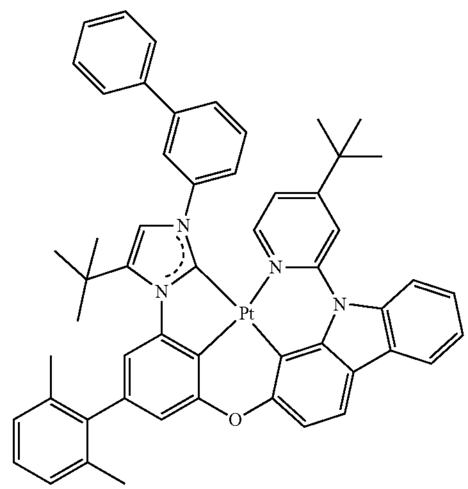
206
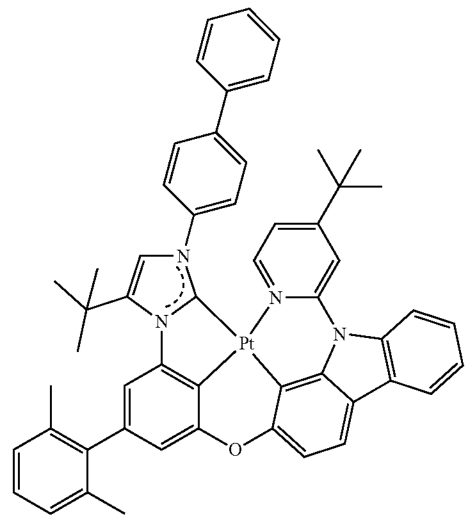
207
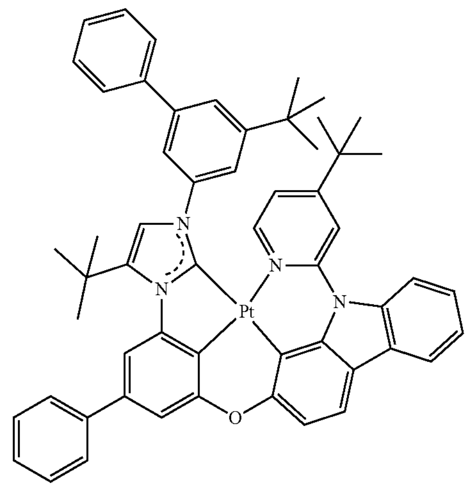

208
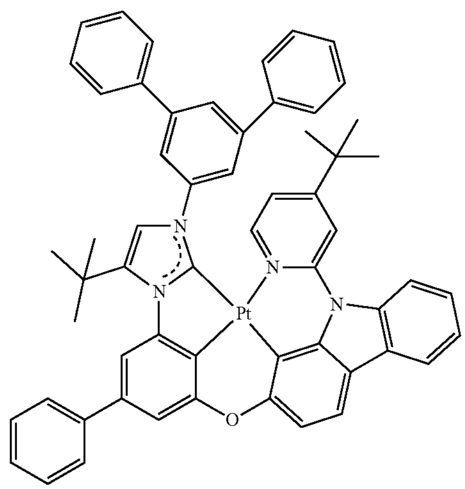
209
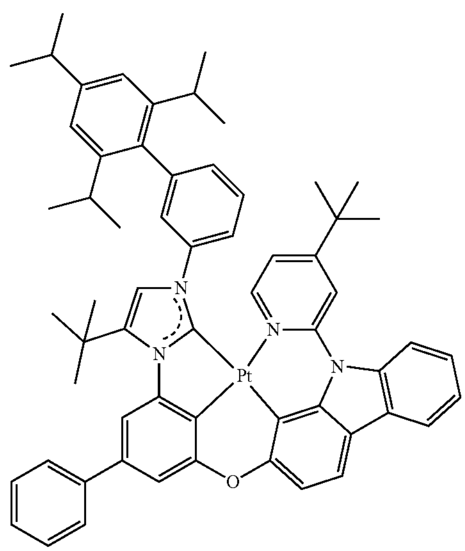
210
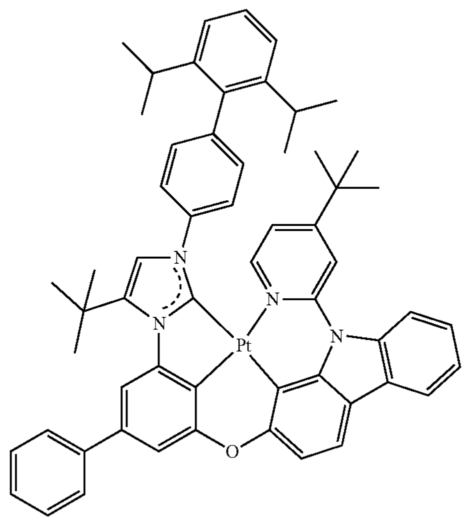
211
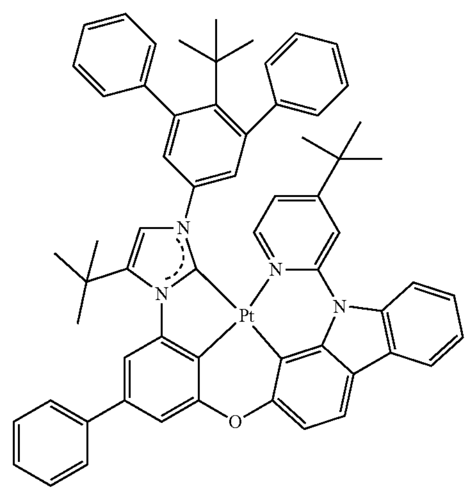
212
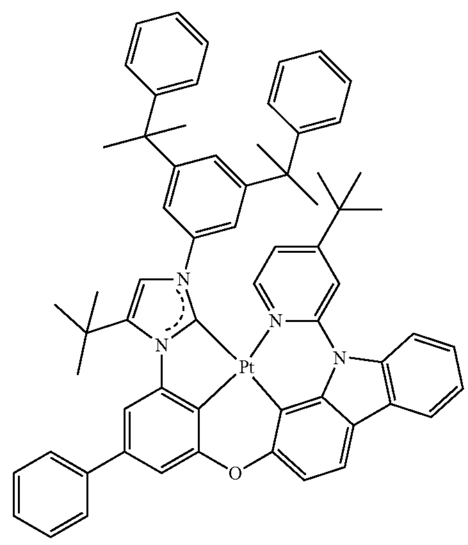
213
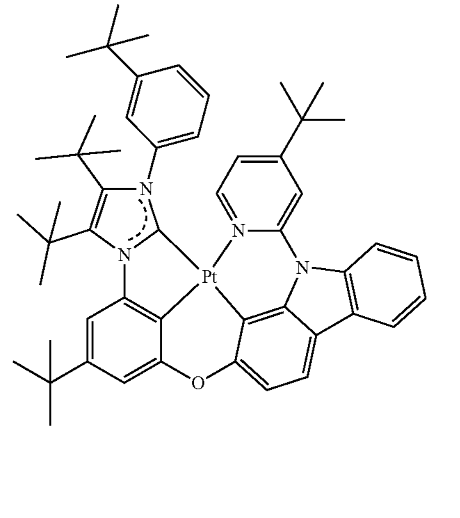

-continued
214
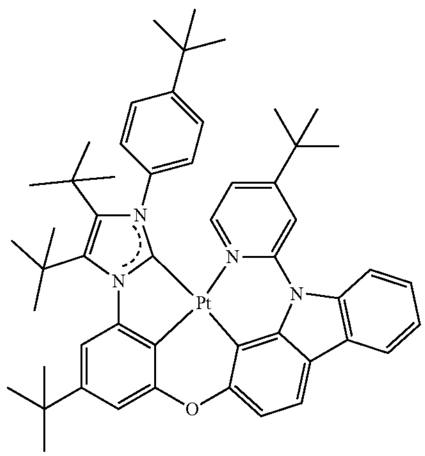
215
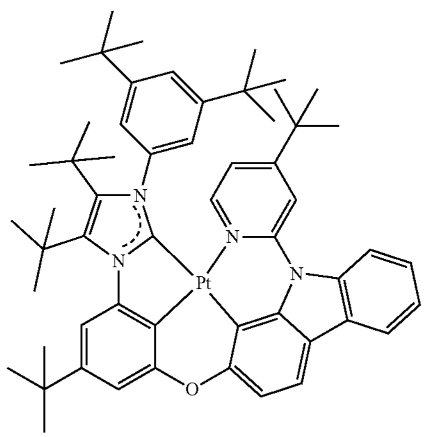
216
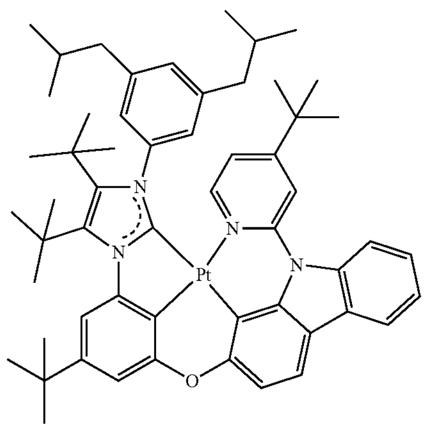
-continued
217
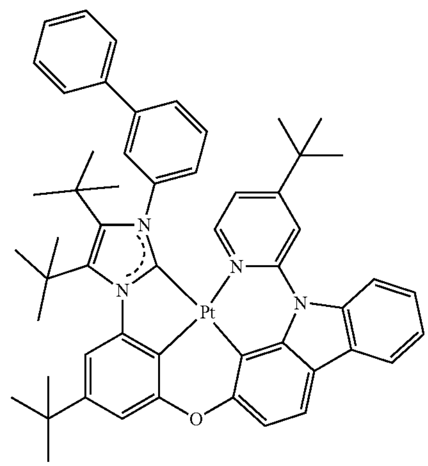
218
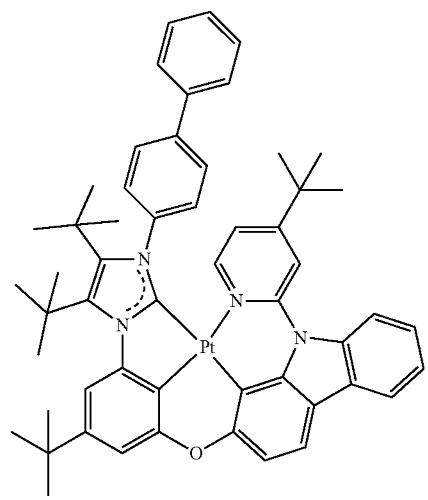
219
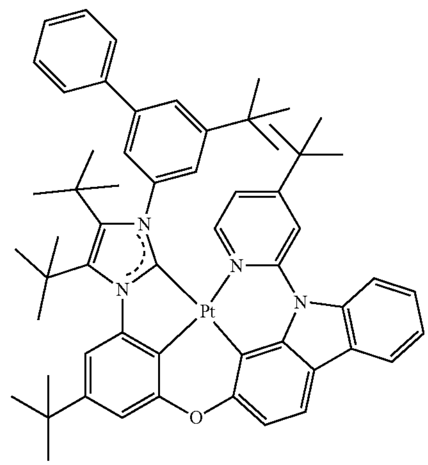

-continued
220
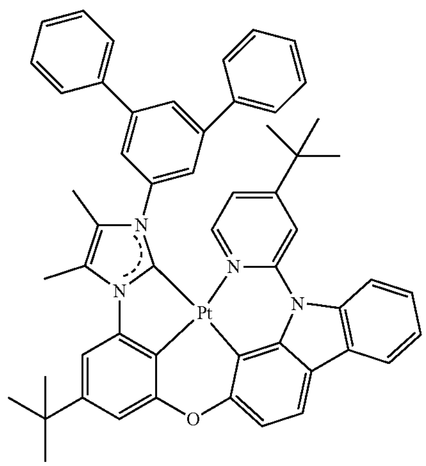
221
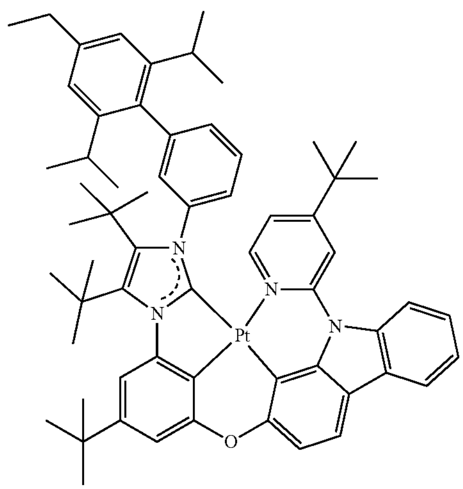
222
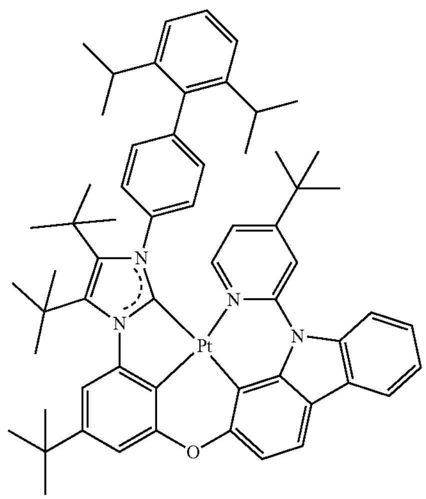
-continued
223
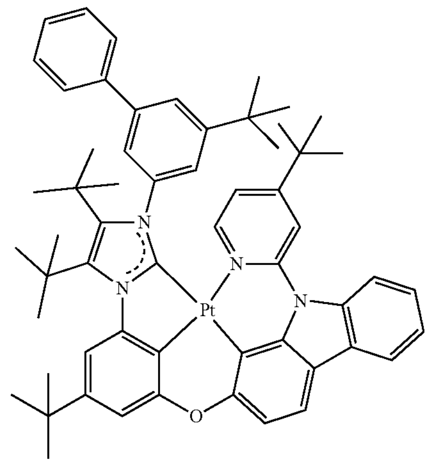
224
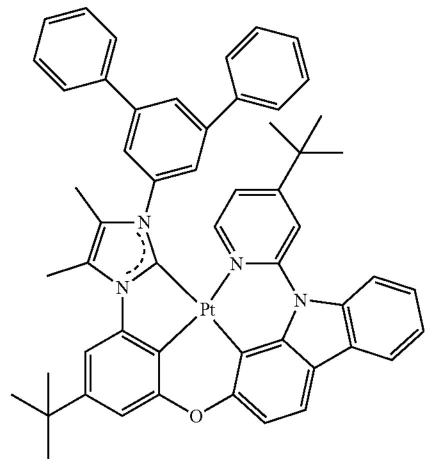
225
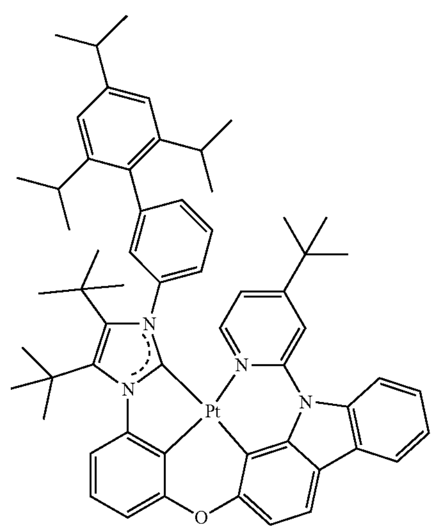

-continued
226
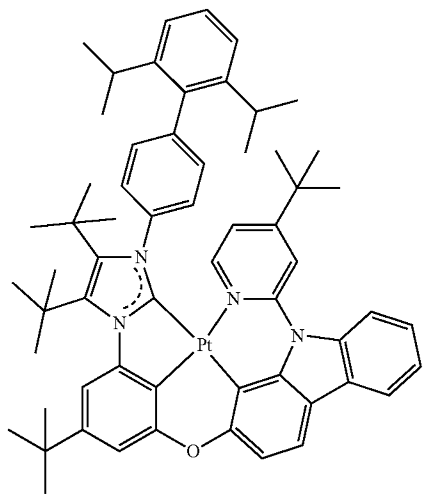
227
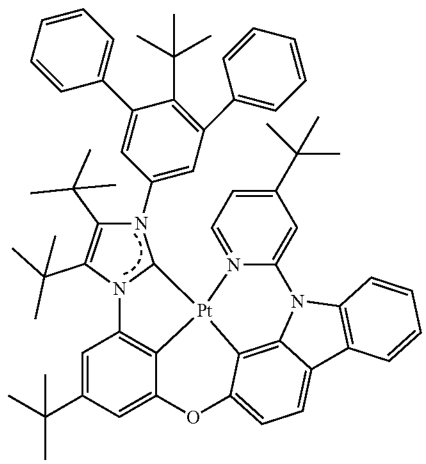
228
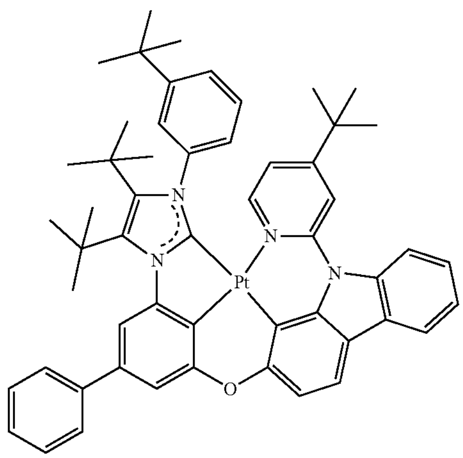
229
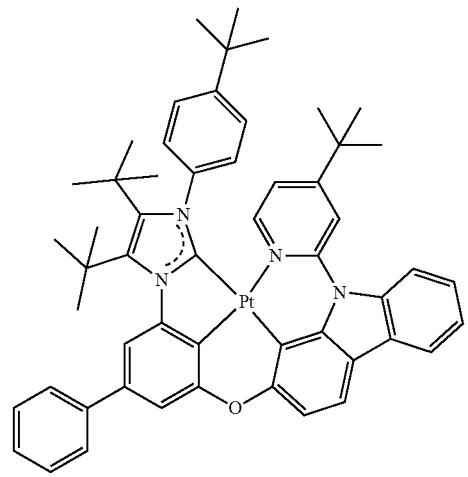
230
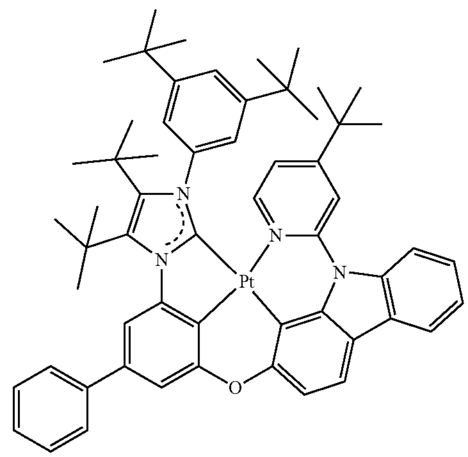
231
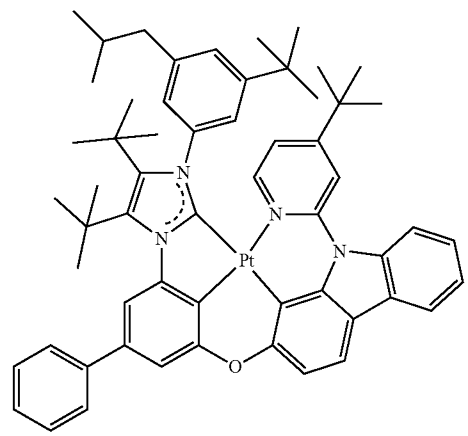

-continued
232
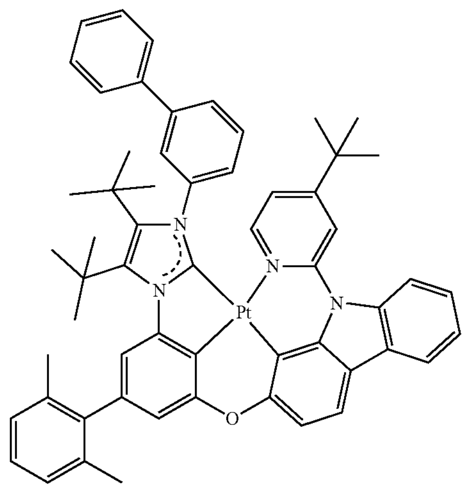
233
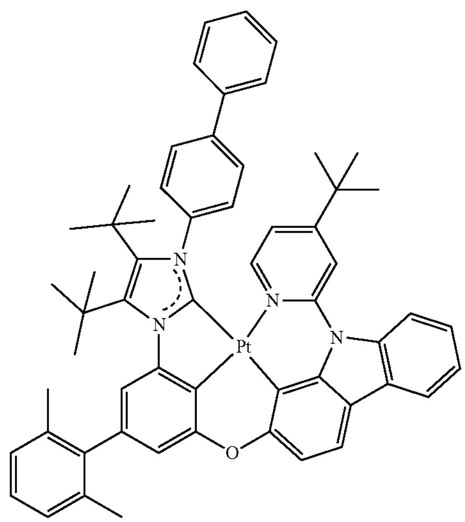
234
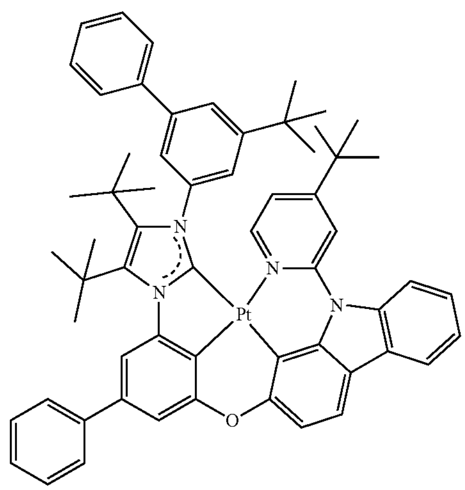
-continued
235
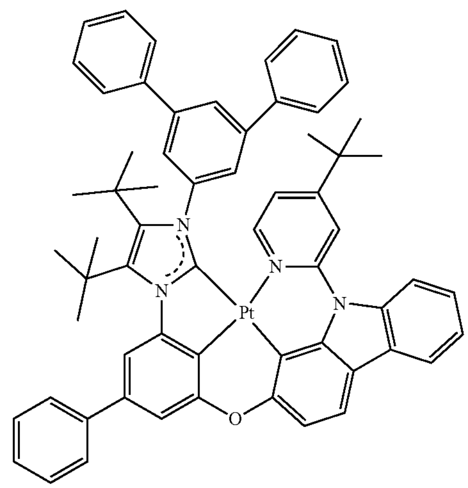
236
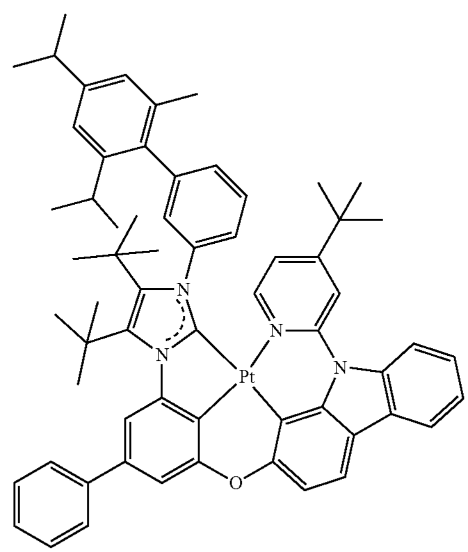
237
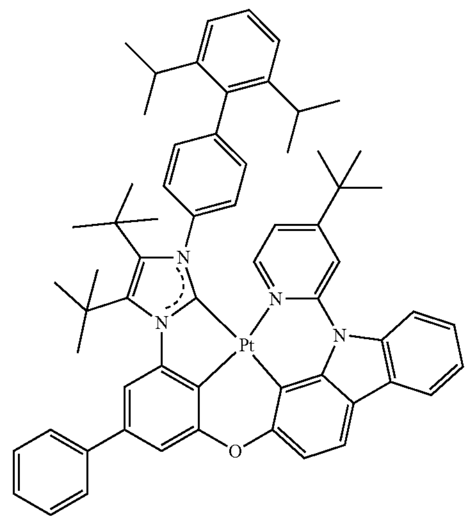

-continued
238
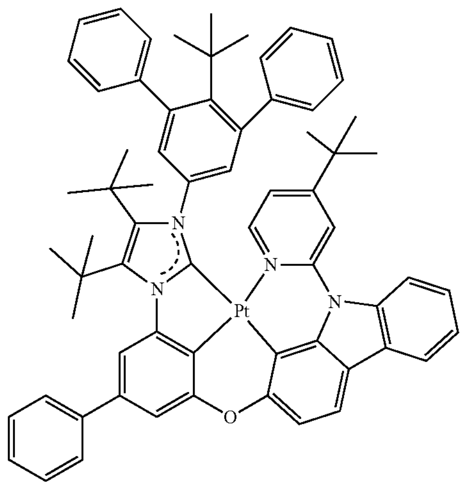
239
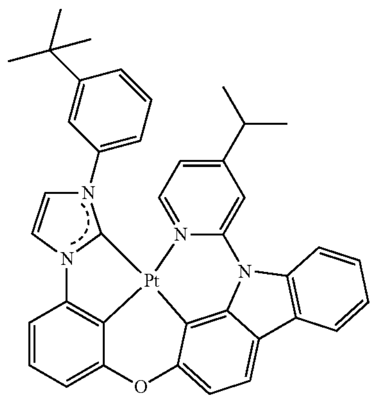
240
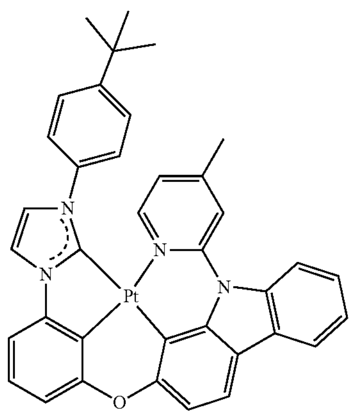
-continued
241
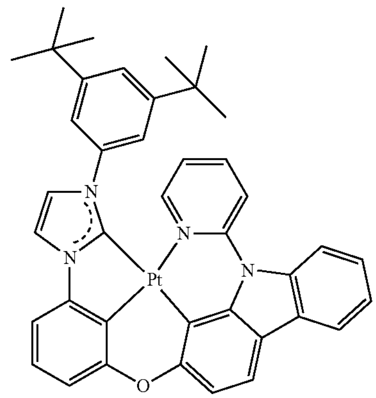
242
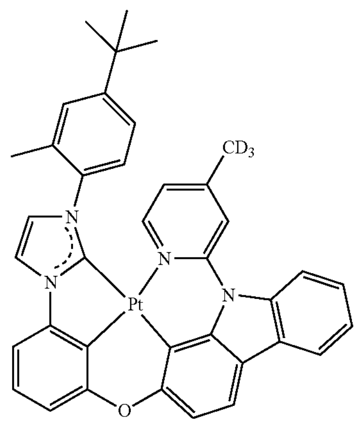
243
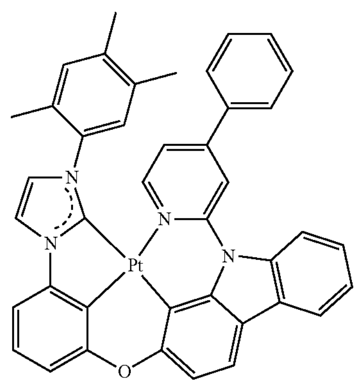
244
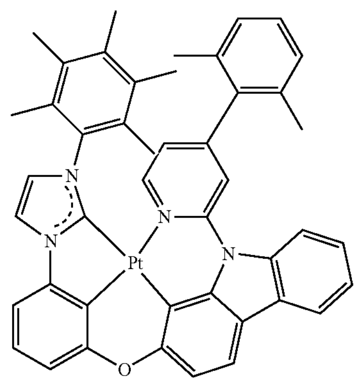

-continued
245
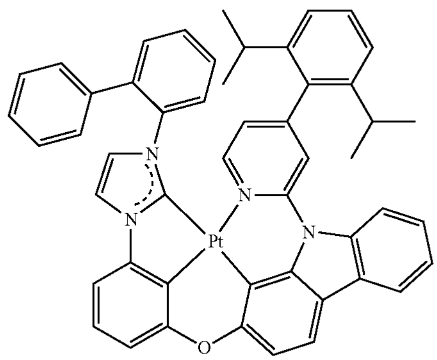
246
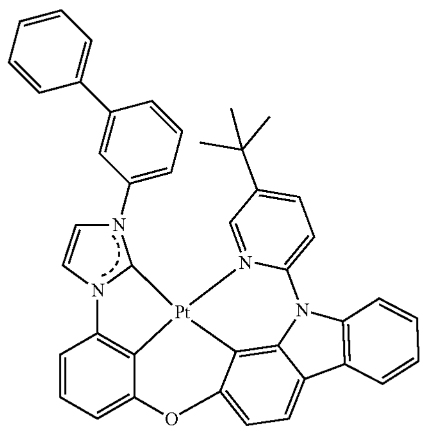
247
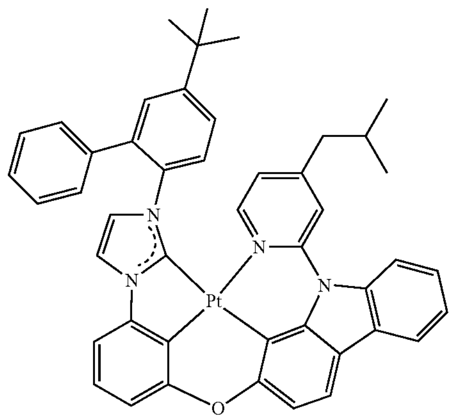
-continued
248
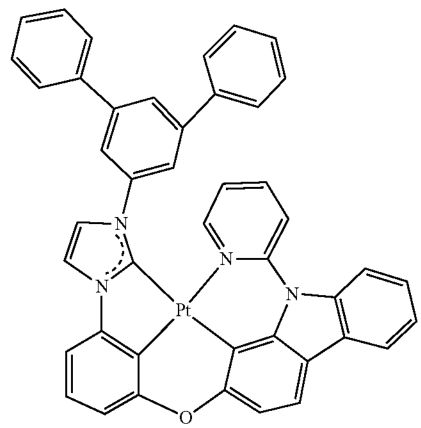
249
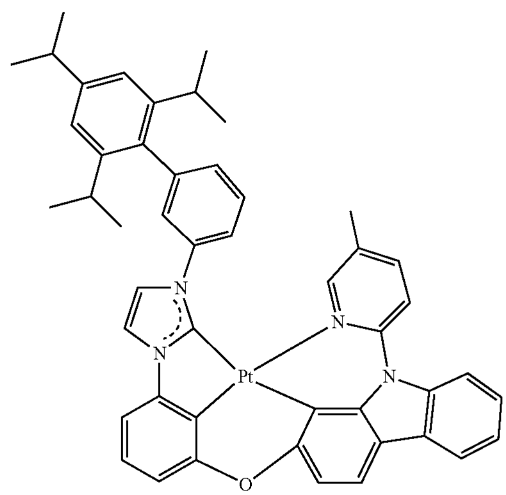
250
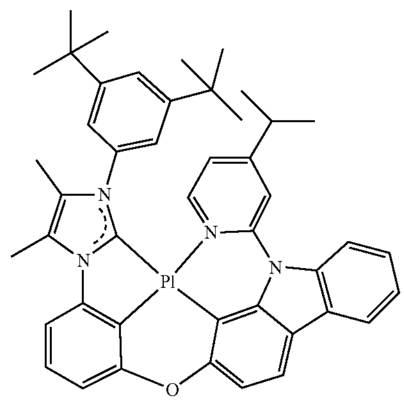

-continued
251
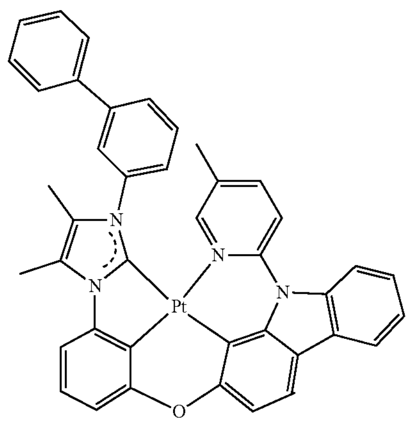
252
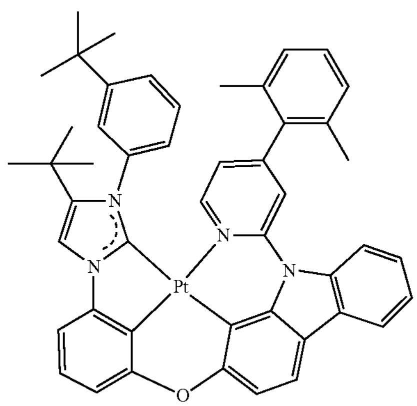
253
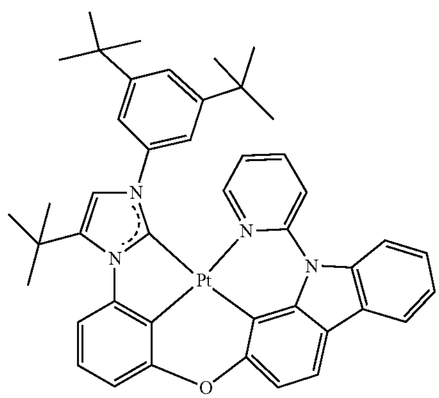
254
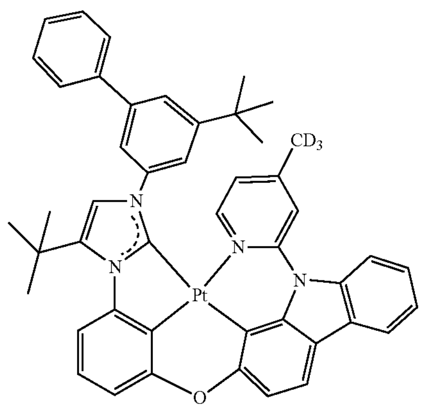
-continued
255
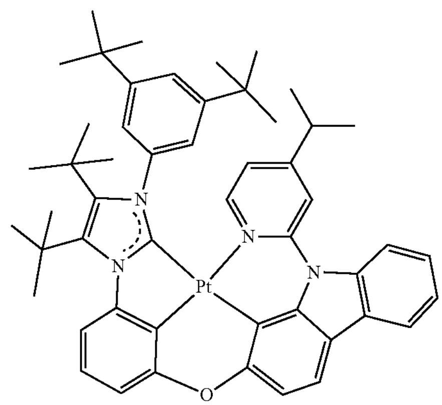
256
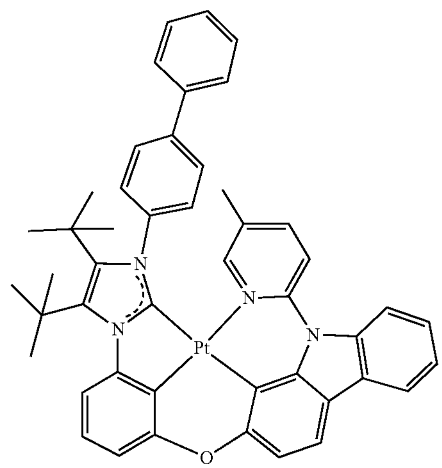
257
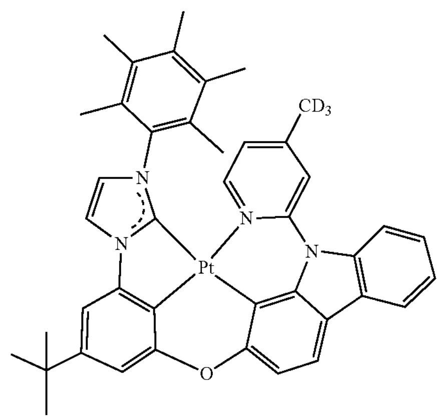

-continued
258
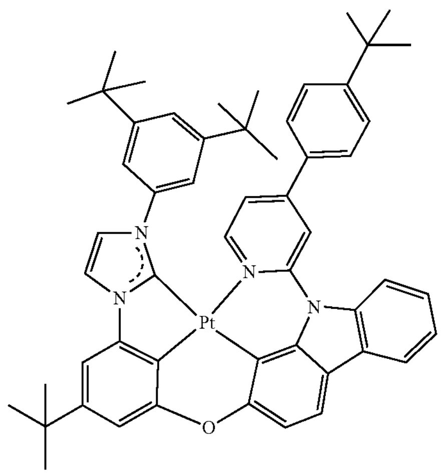
259
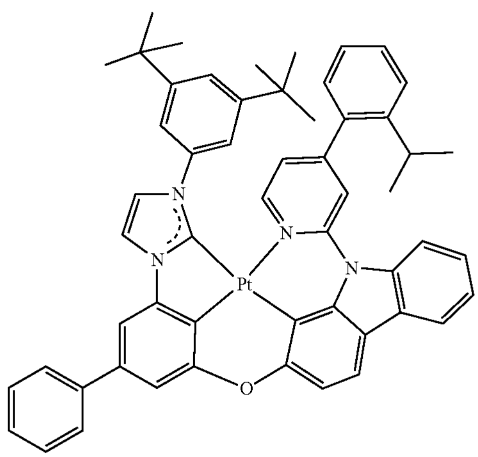
260
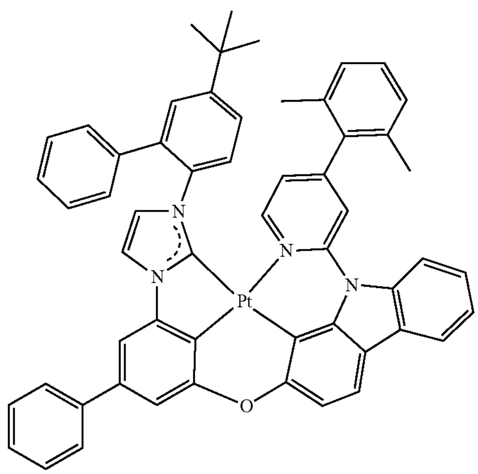
-continued
261
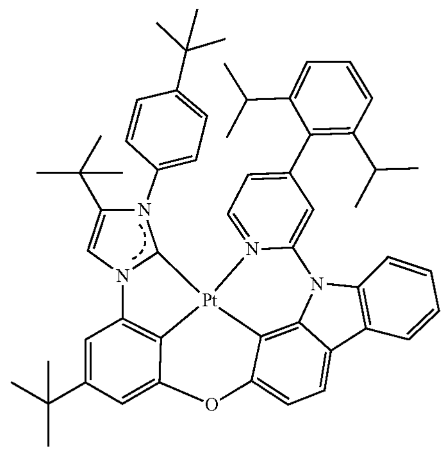
262
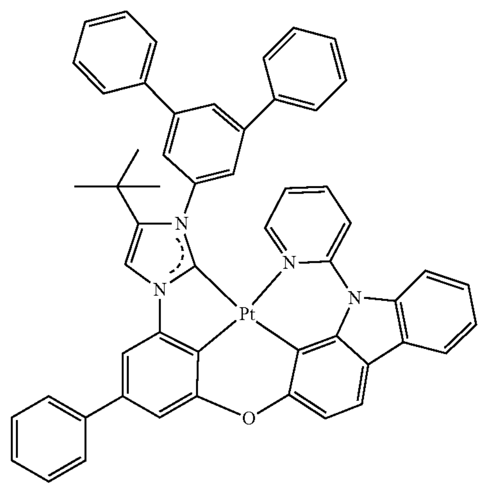
263
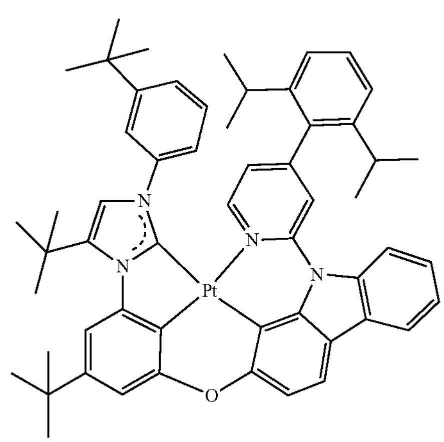

-continued
264
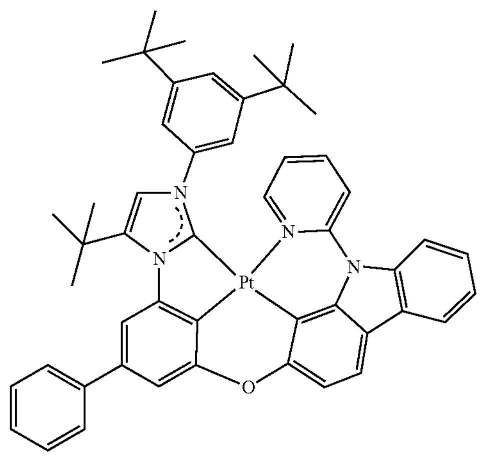
265
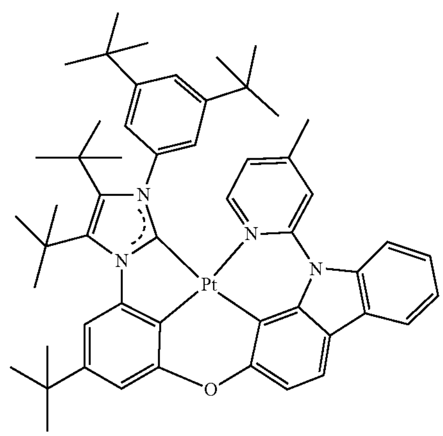
266
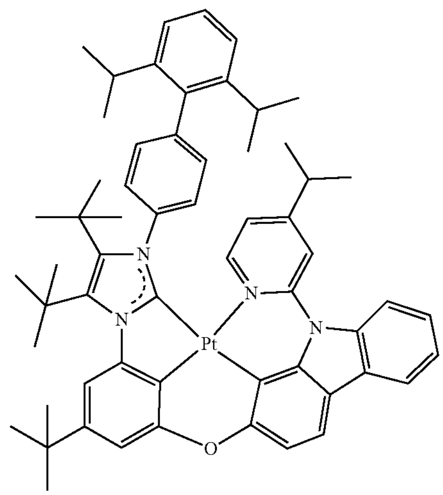
-continued
267
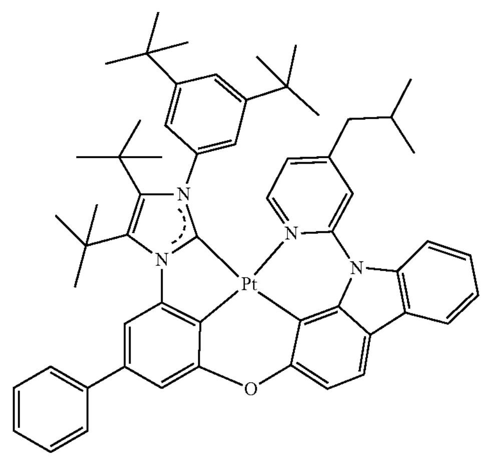
268
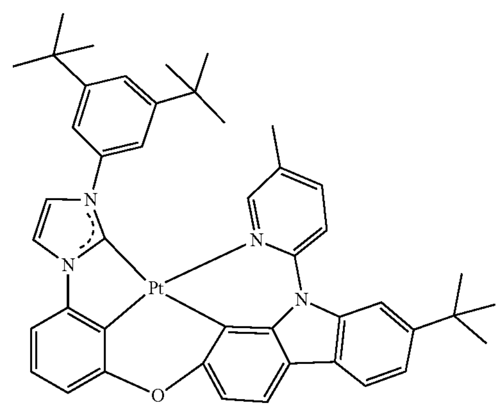
269
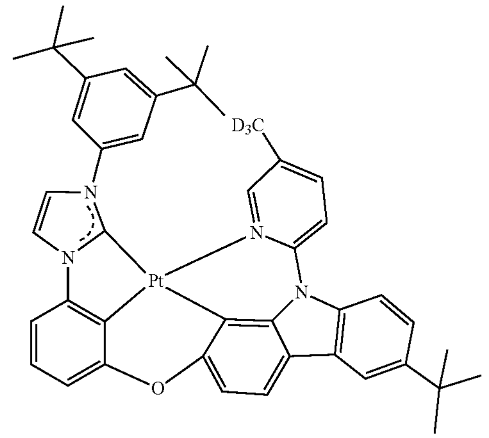

-continued
270
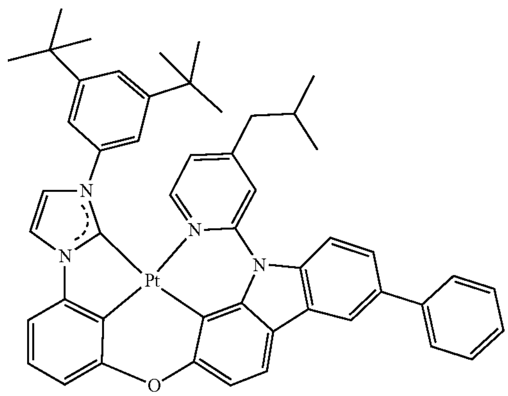
271
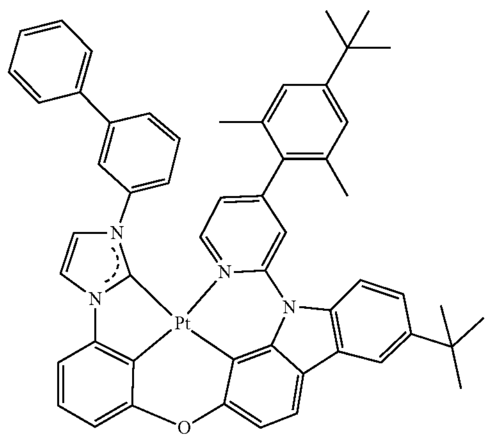
272
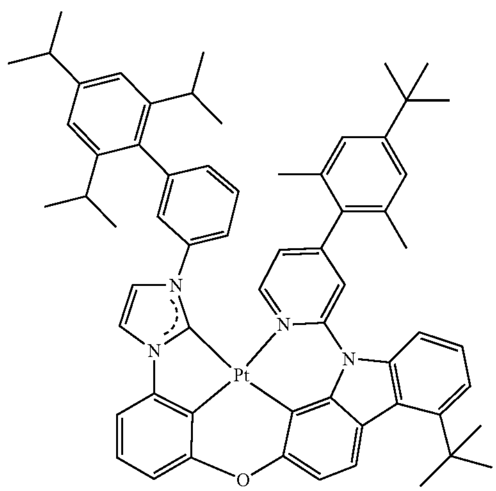
-continued
273
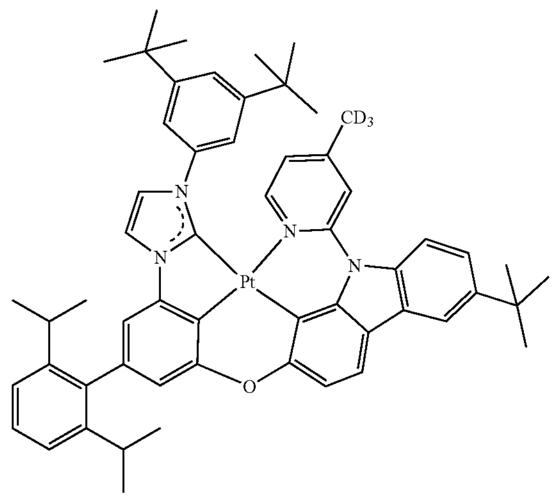
274
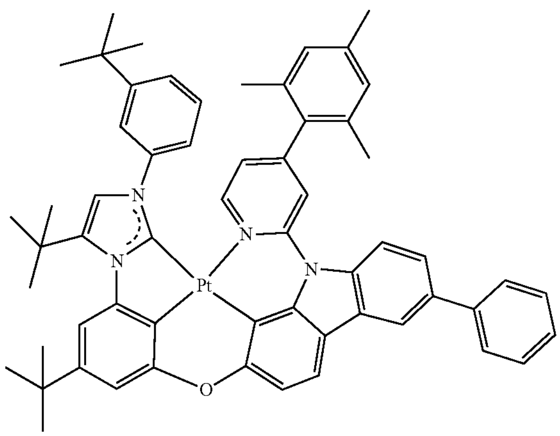
275
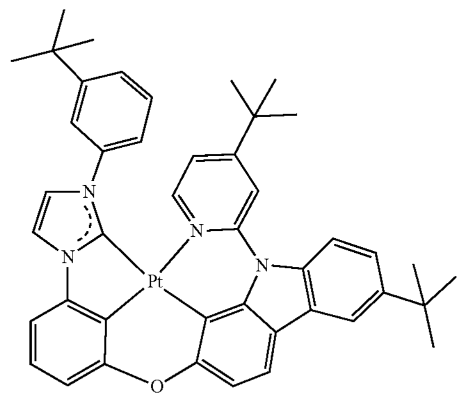

-continued
276
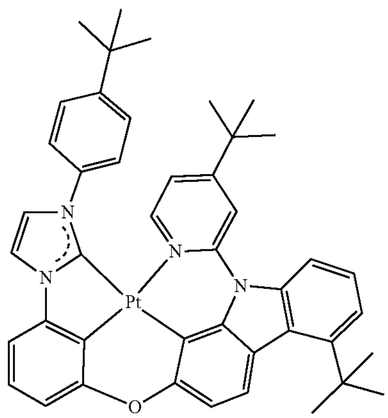
277
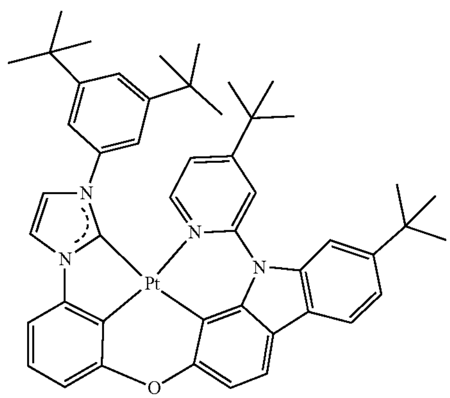
278
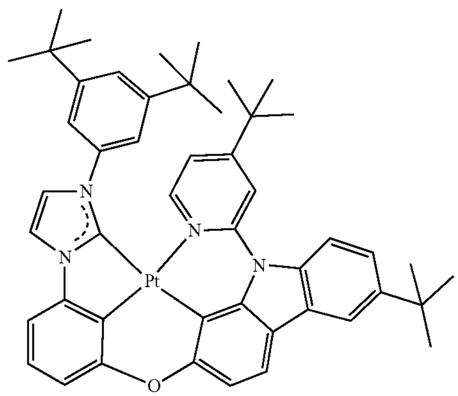
279
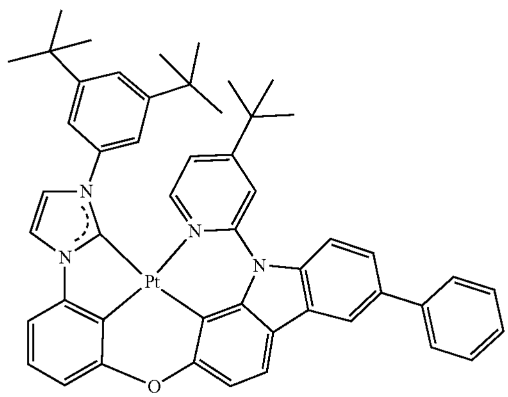
-continued
280
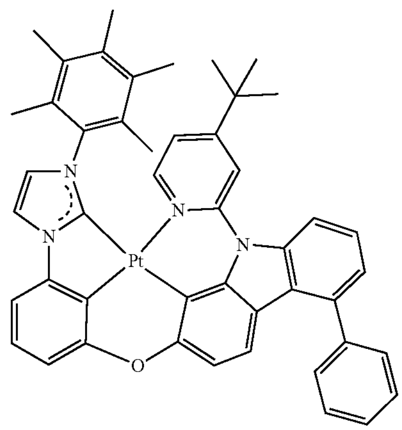
281
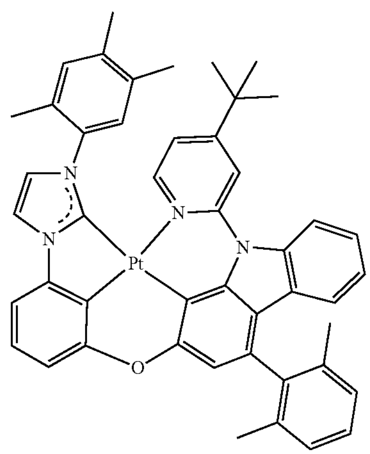
282
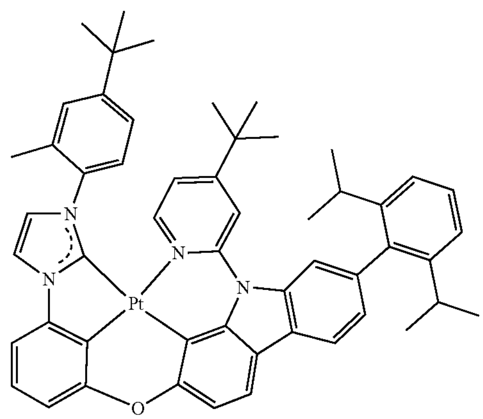
283
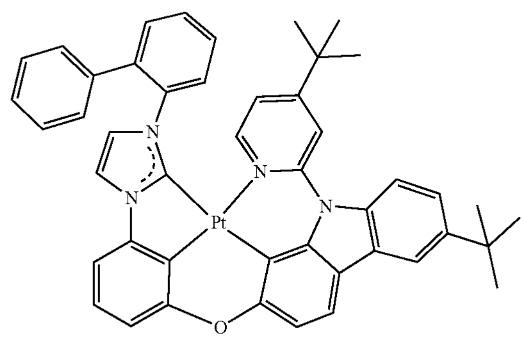

-continued
284
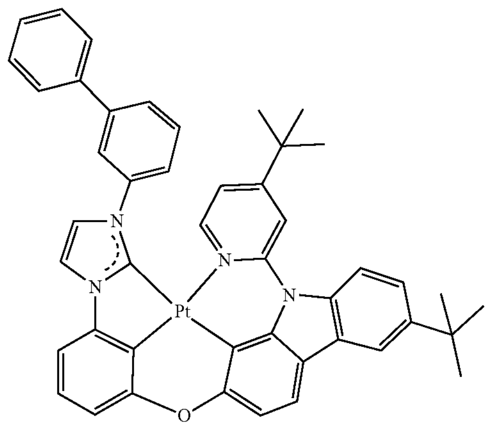
285
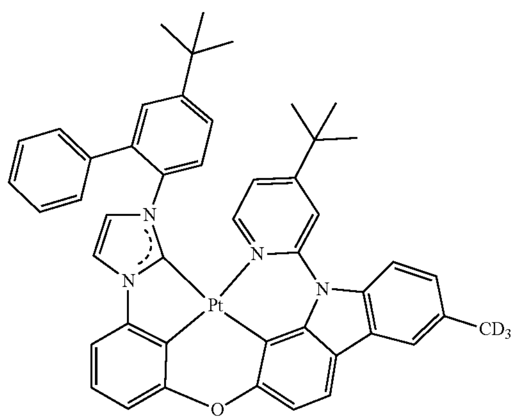
286
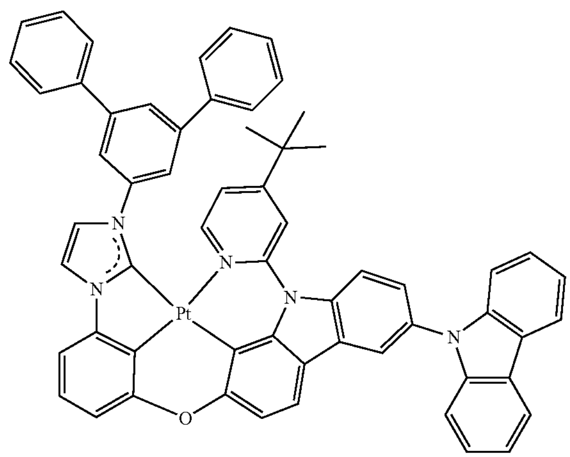
-continued
287
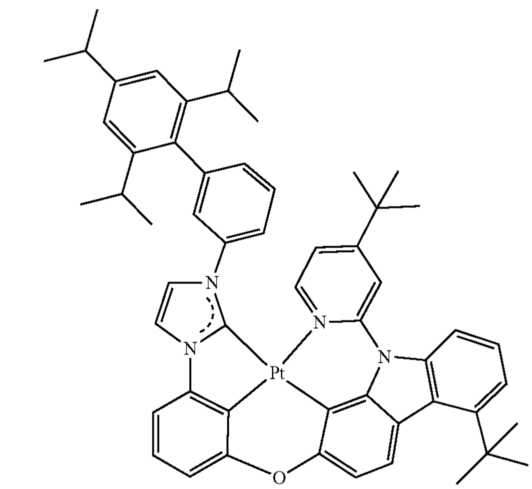
288
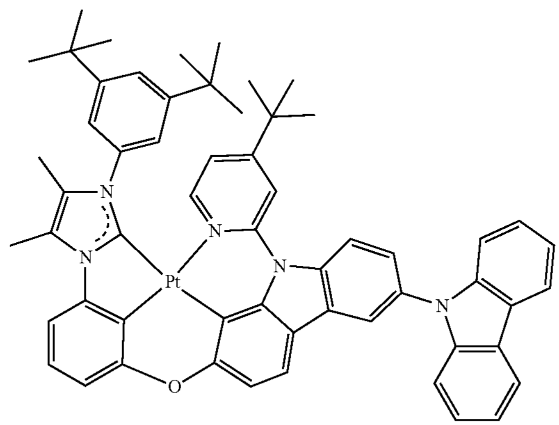
289
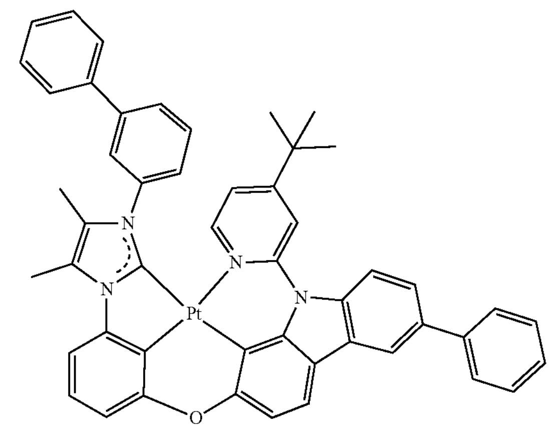

-continued
290
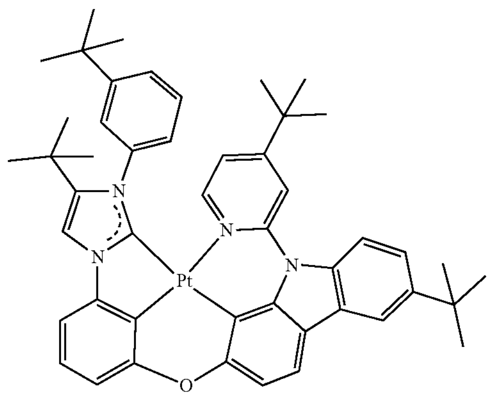
291
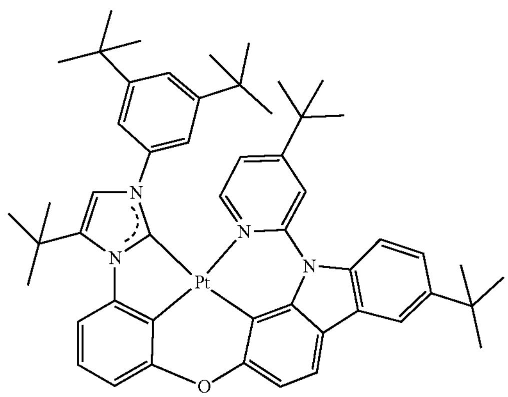
292
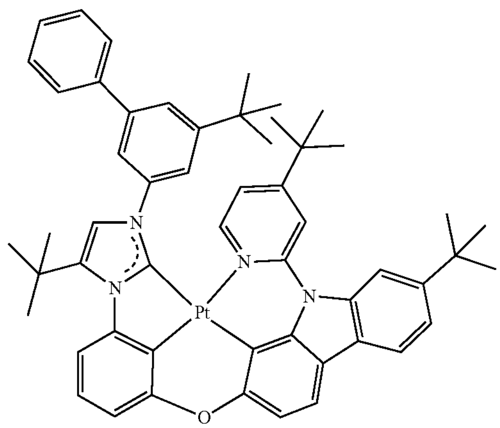
-continued
293
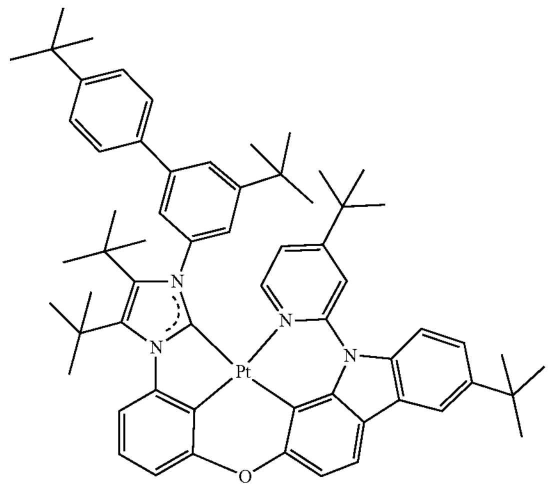
294
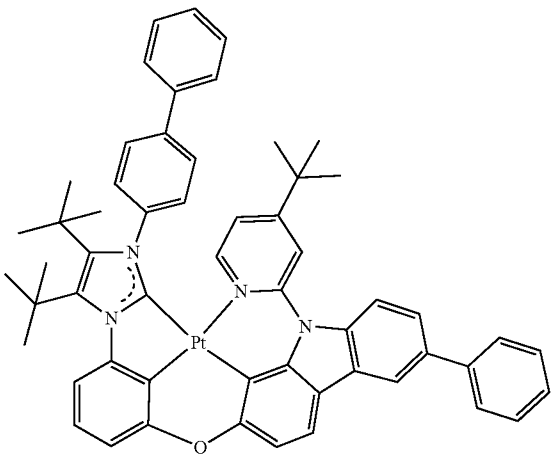
295
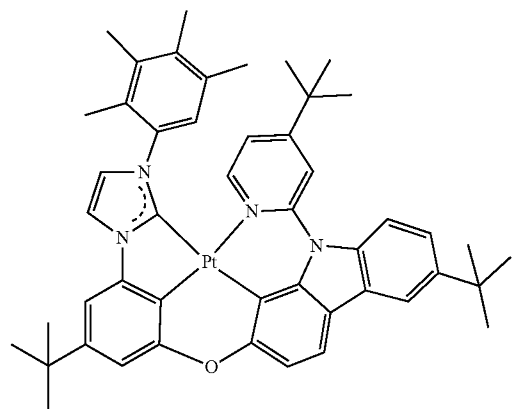

-continued
296
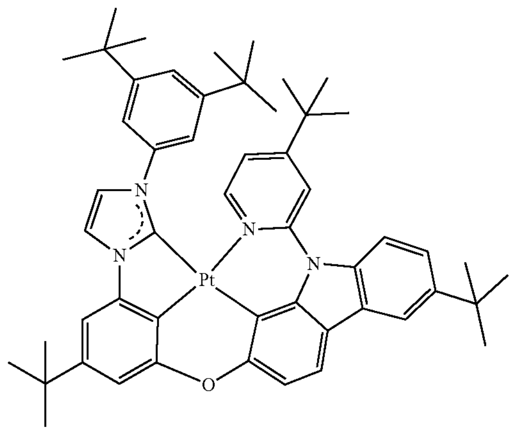
297
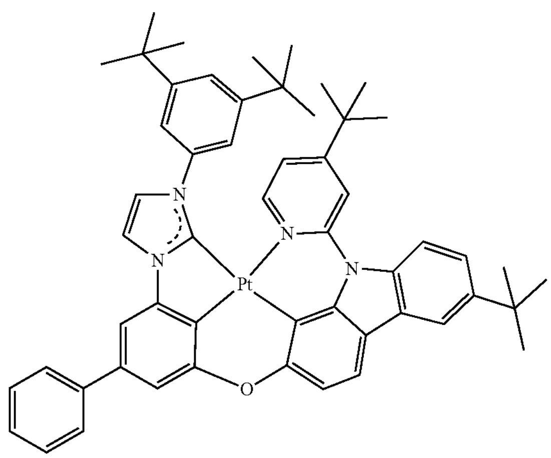
298
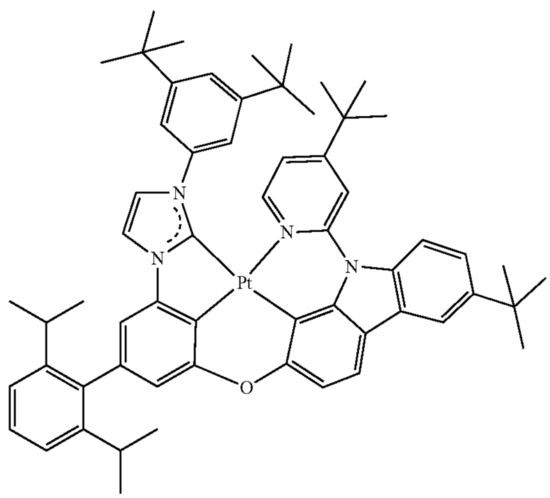
299
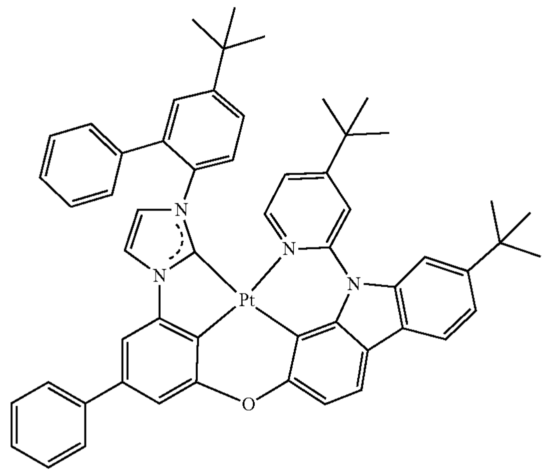
300
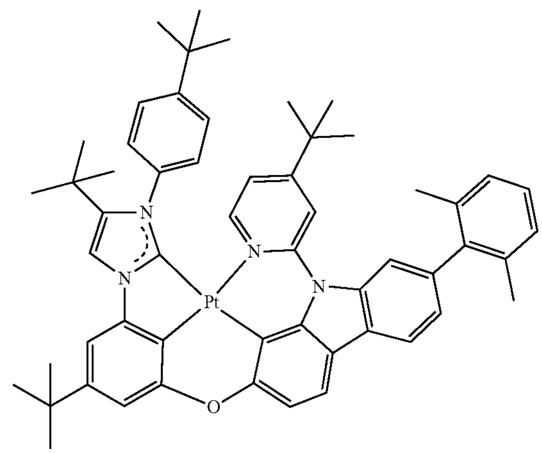
301
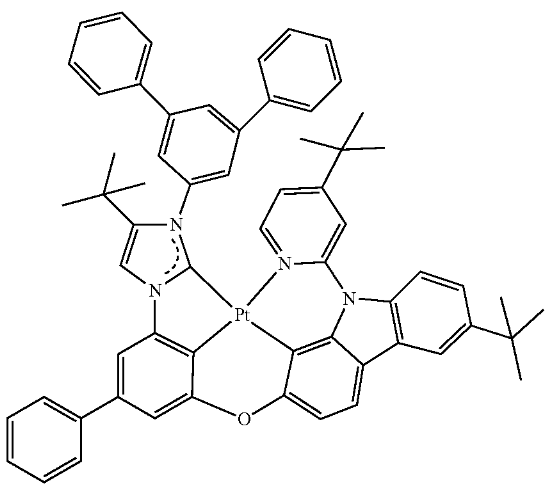

-continued
302
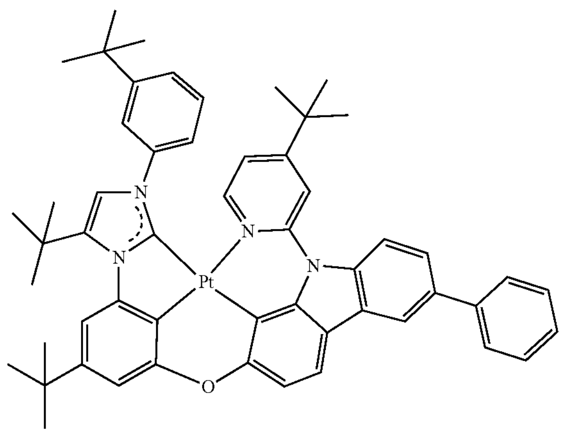
303
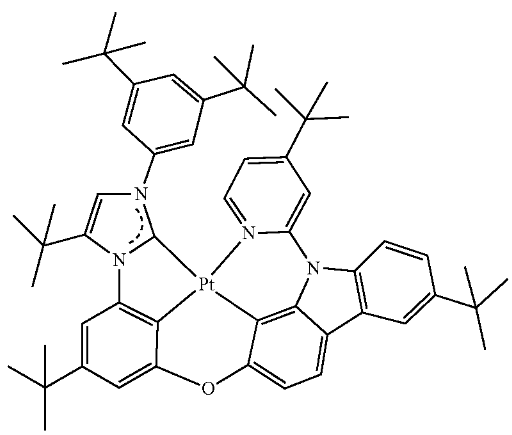
304
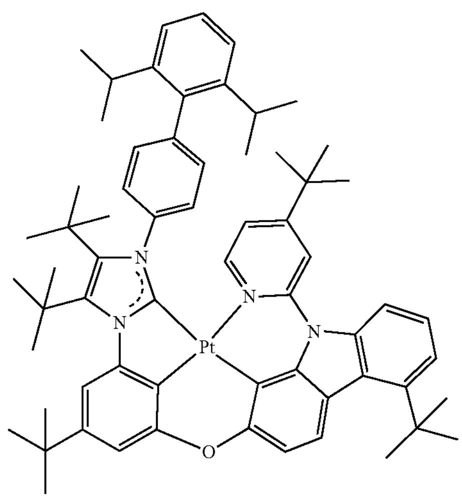
-continued
305
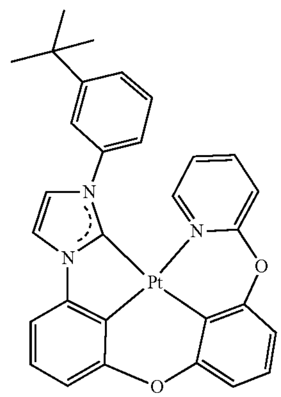
306
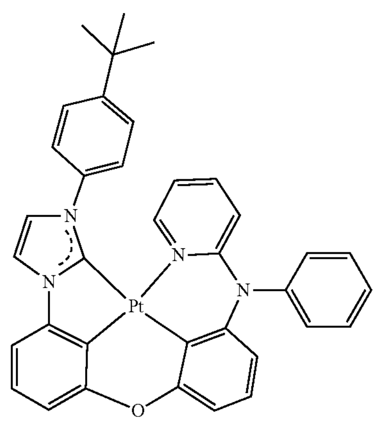
307
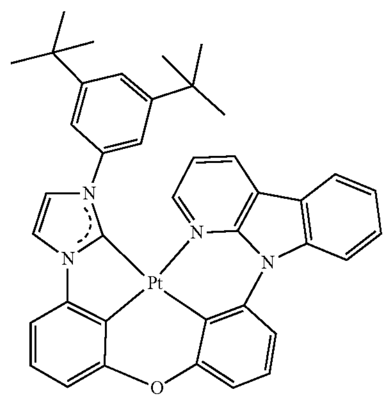
308
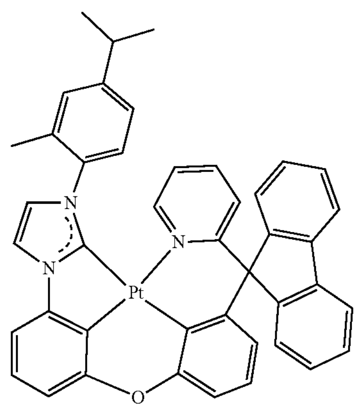

-continued
309
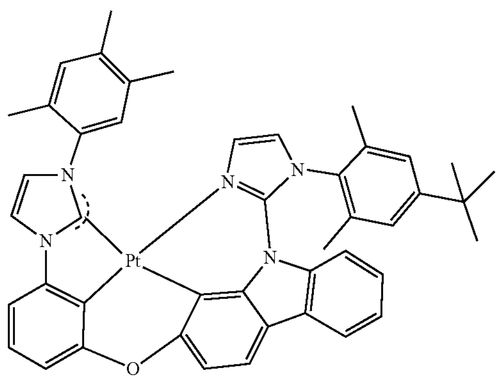
310
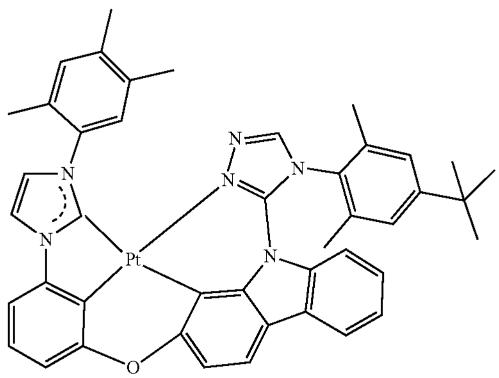
311
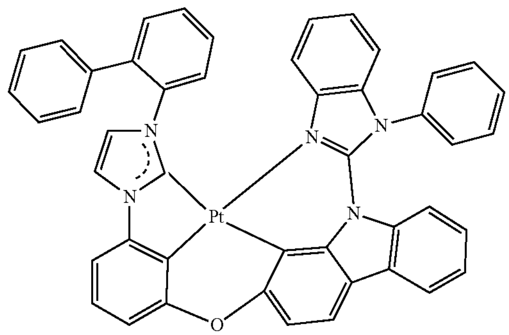
312
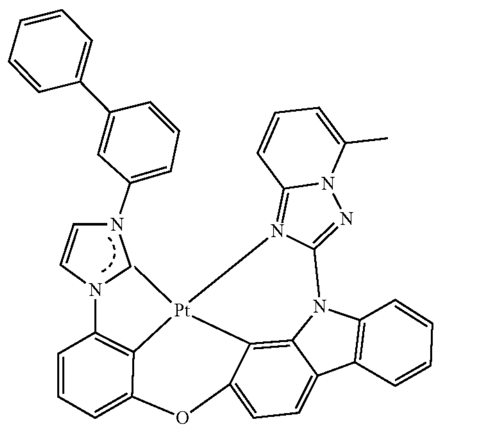
-continued
313
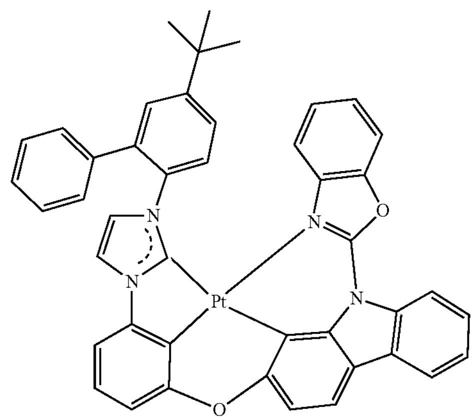
314
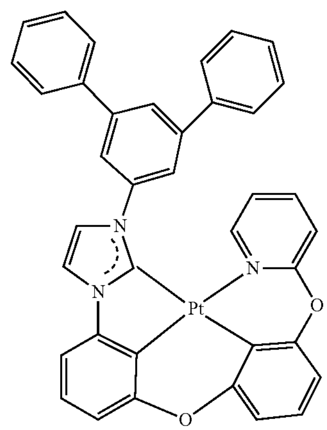
315
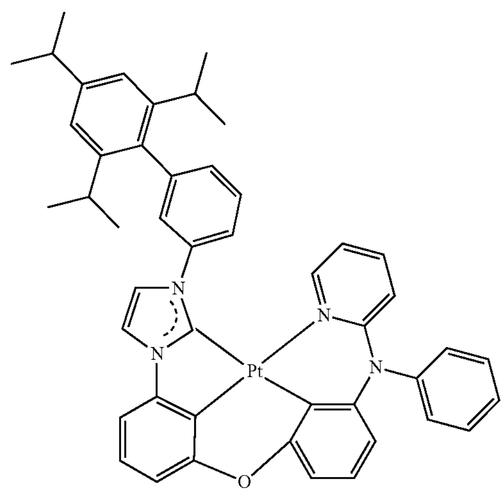

-continued
316
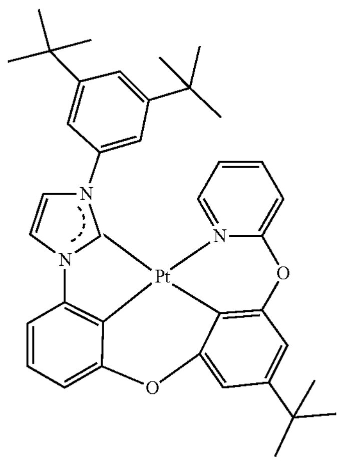
317
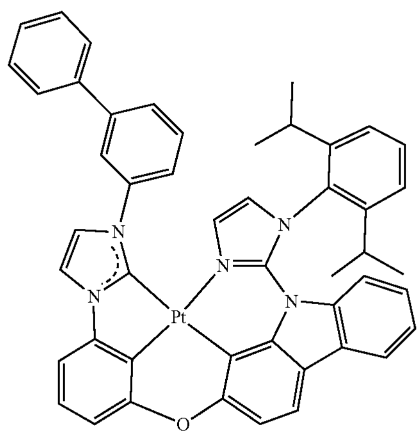
318
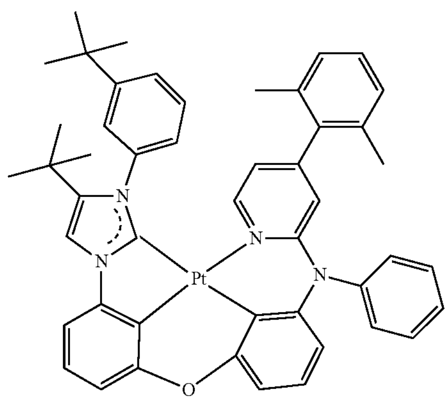
-continued
319
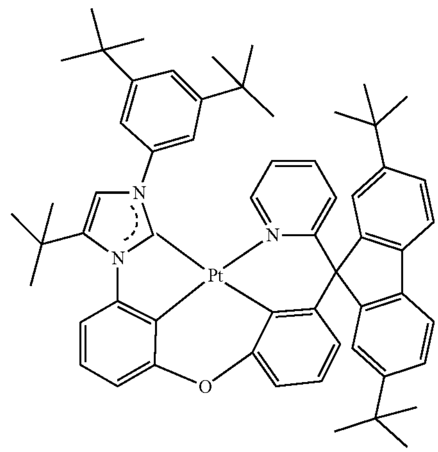
320
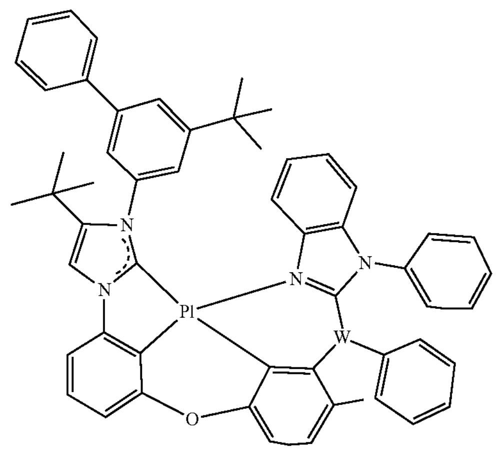
321
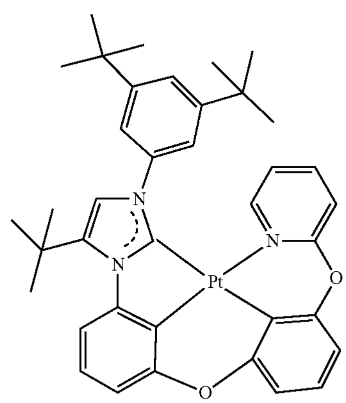

-continued
322
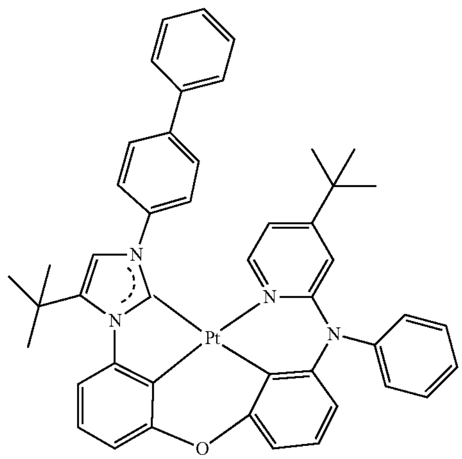
323
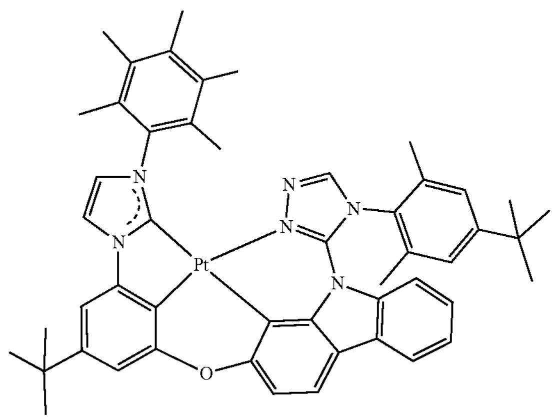
324
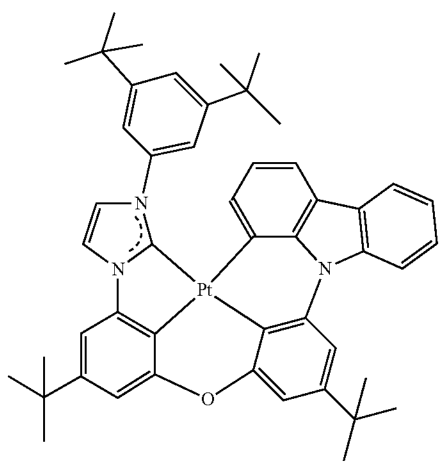
-continued
325
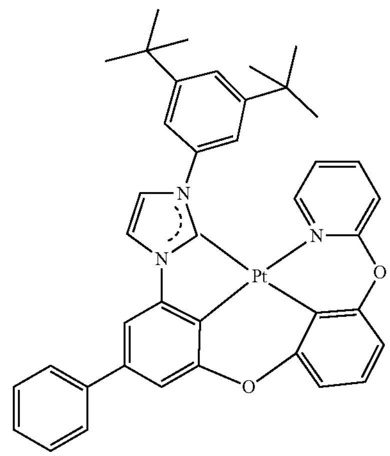
326
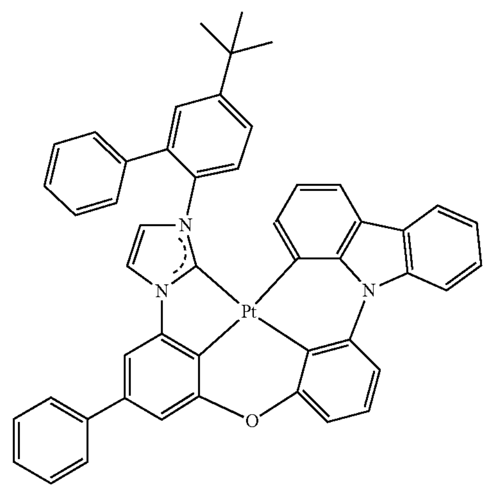
327
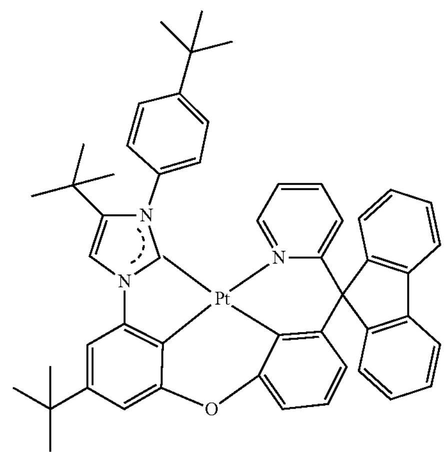

-continued
328
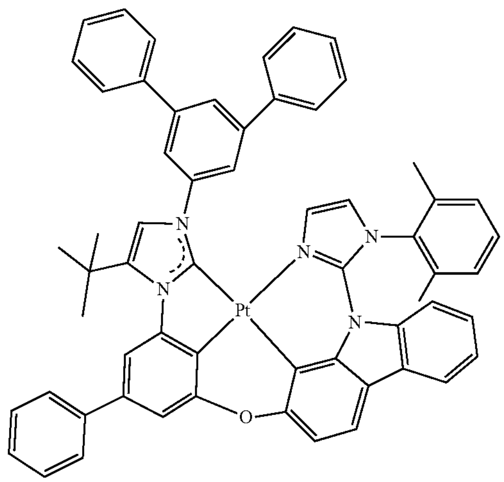
329
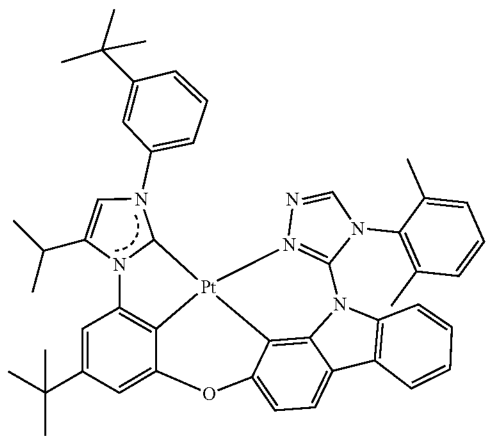
330
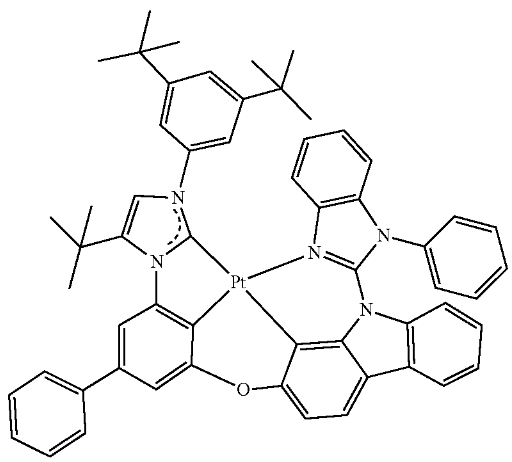
-continued
331
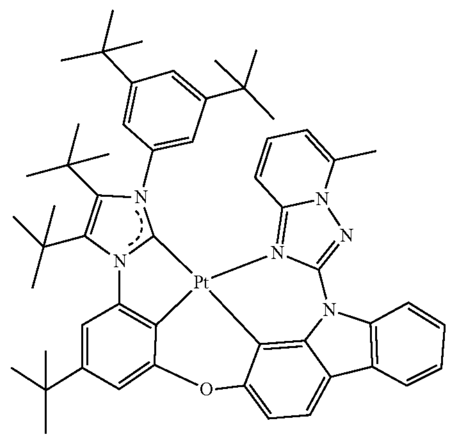
332
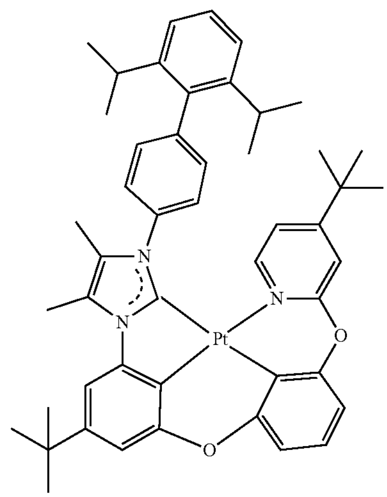
333
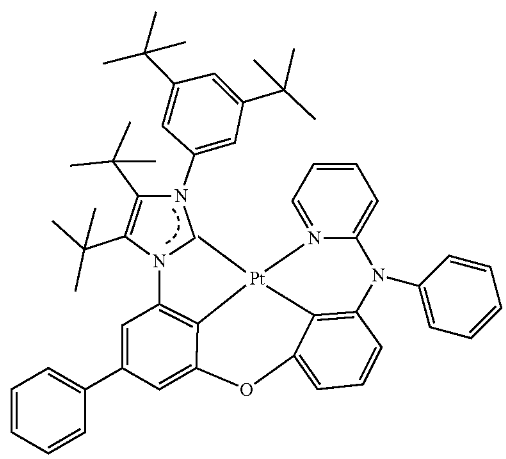

-continued
334
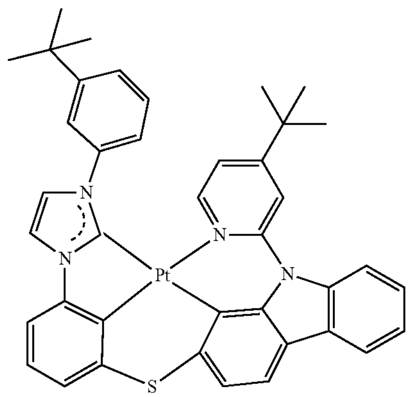
335
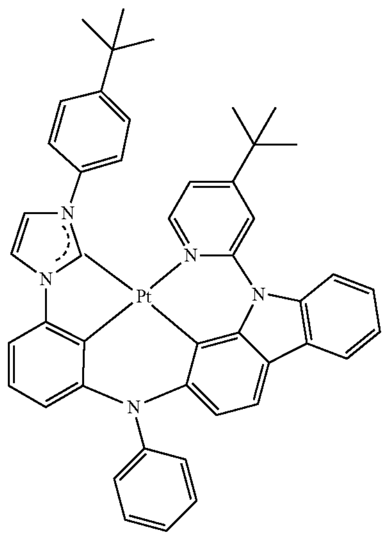
336
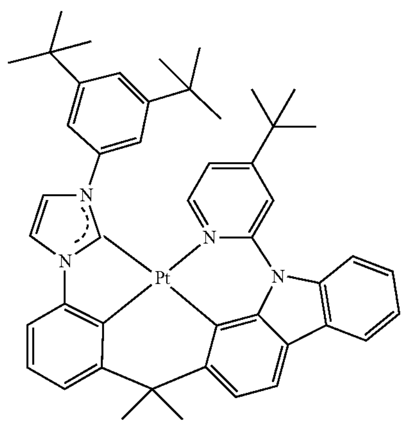
-continued
337
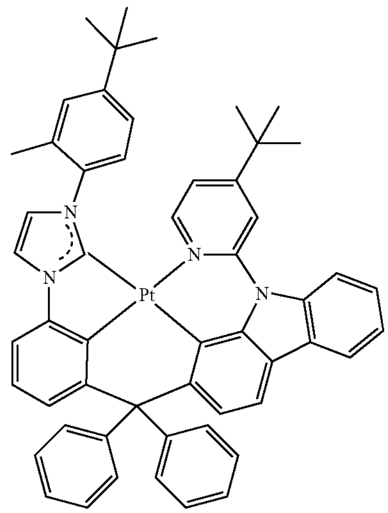
338
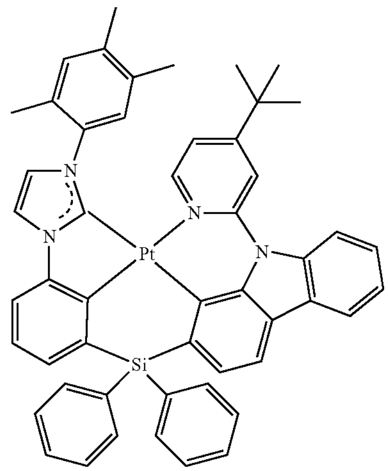
339
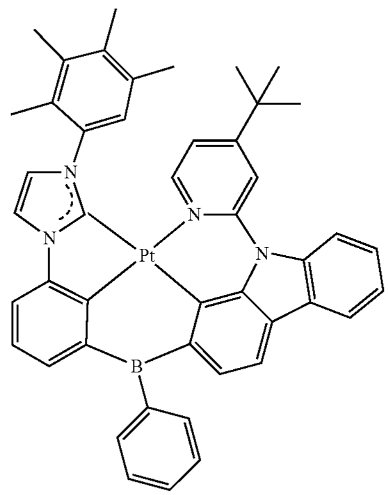

-continued
340
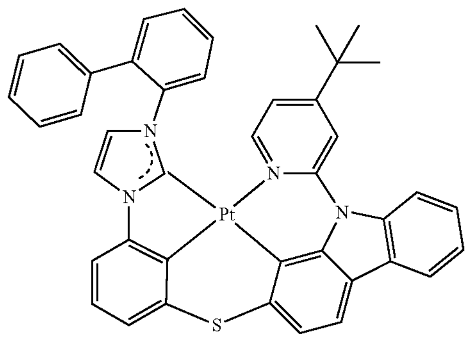
341
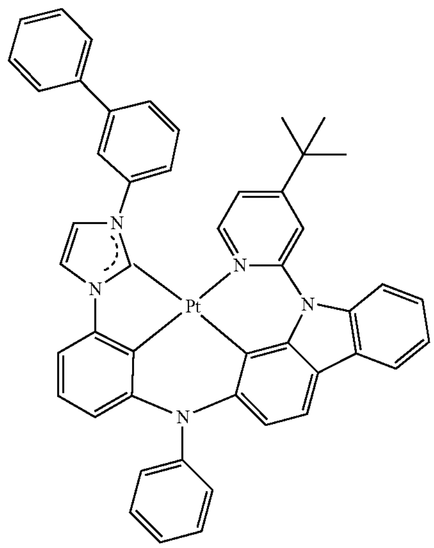
342
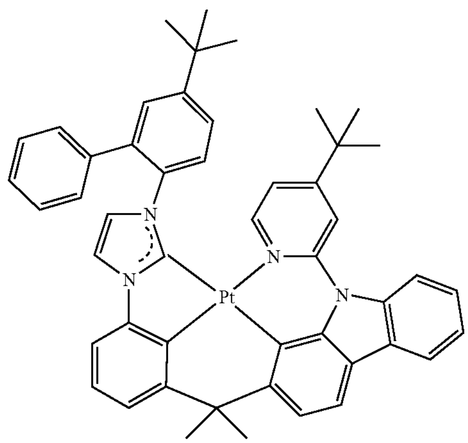
-continued
343
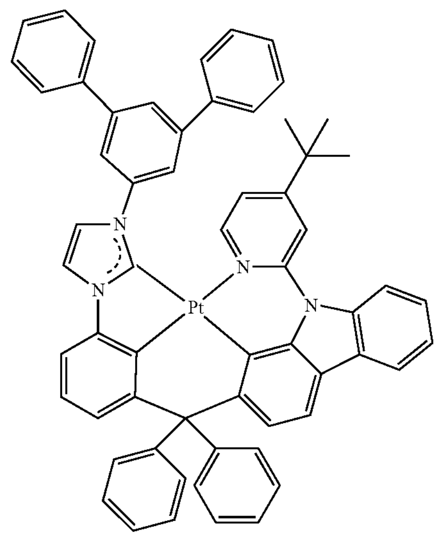
344
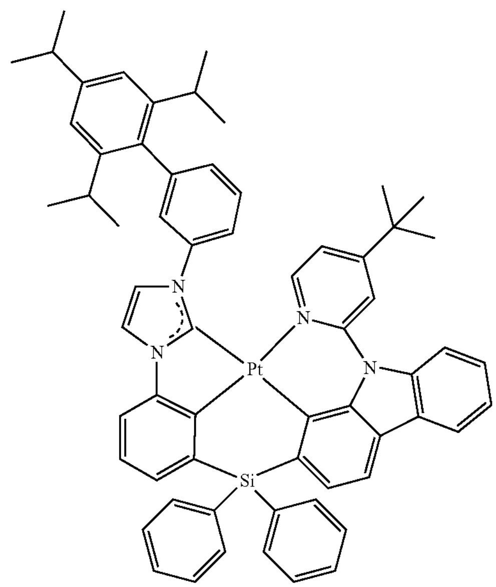
345
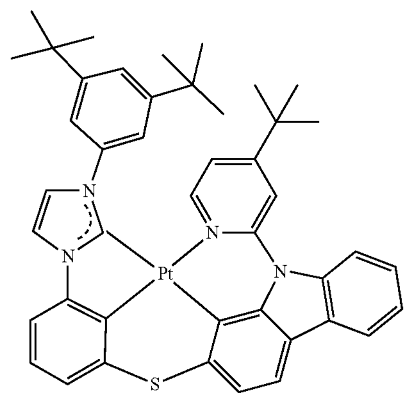

-continued
346
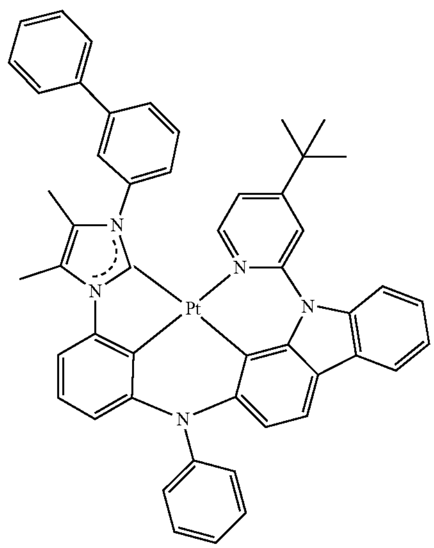
347
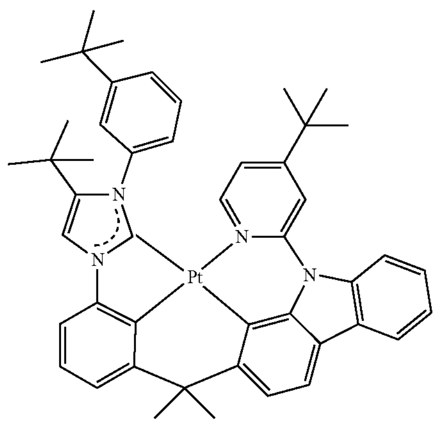
348
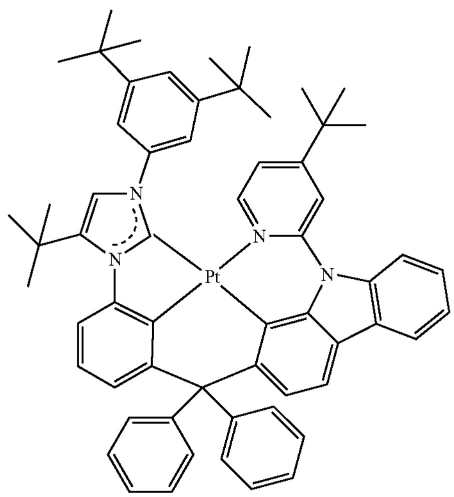
-continued
349
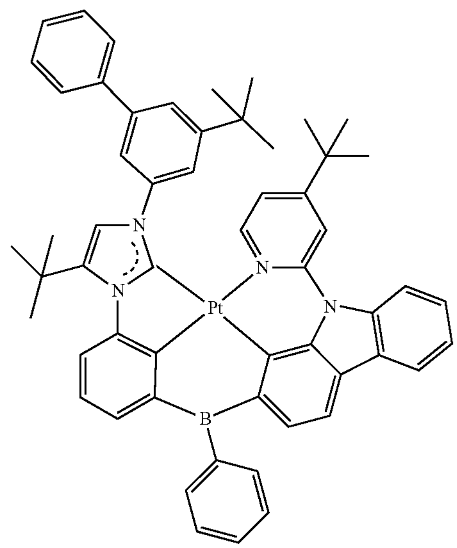
350
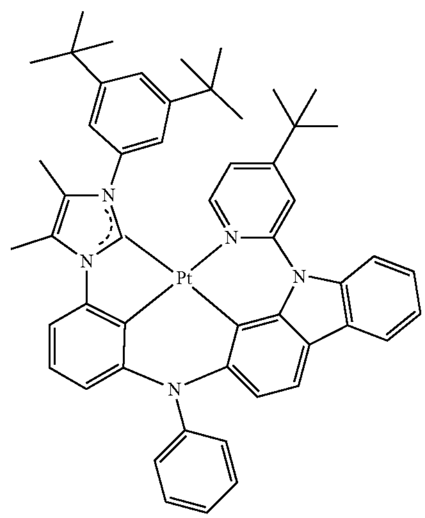
351
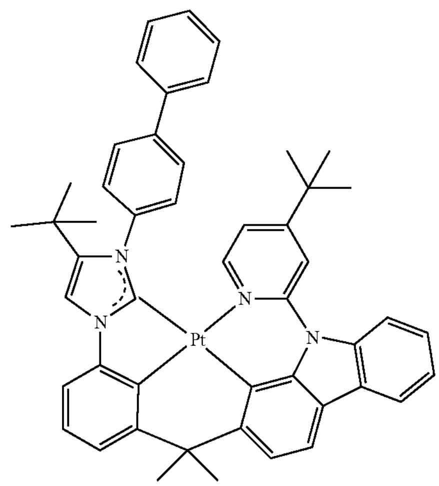

-continued
352
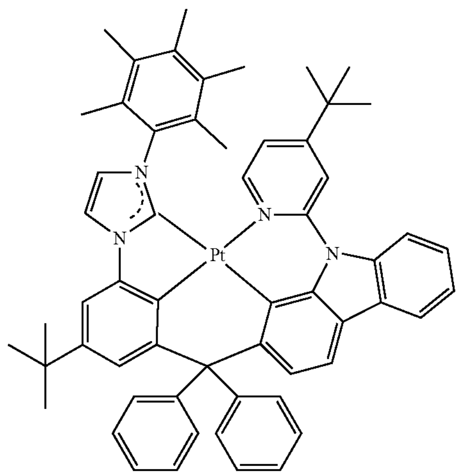
353
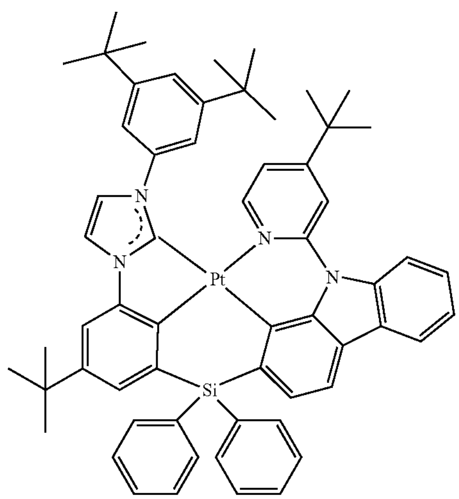
354
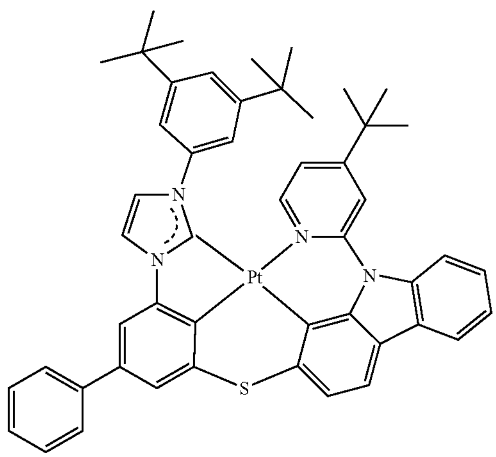
-continued
355
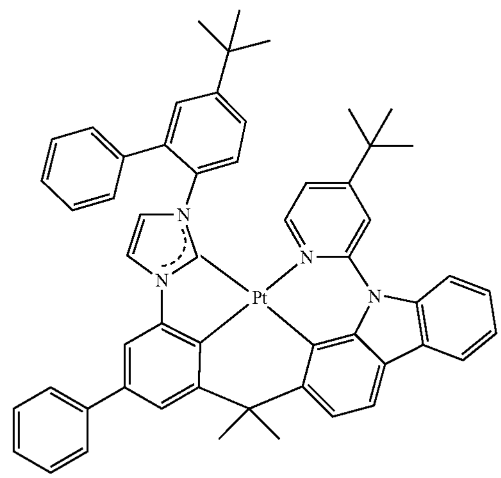
356
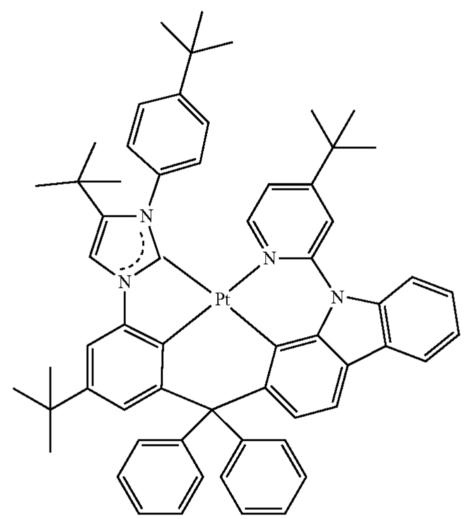
357
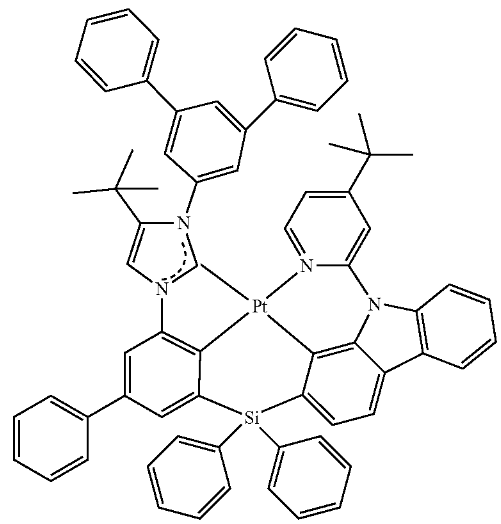

-continued
358
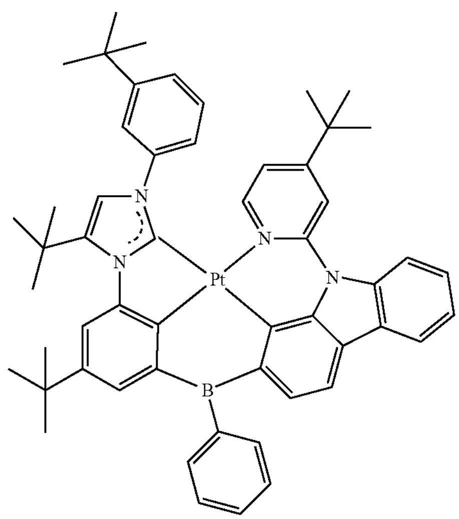
359
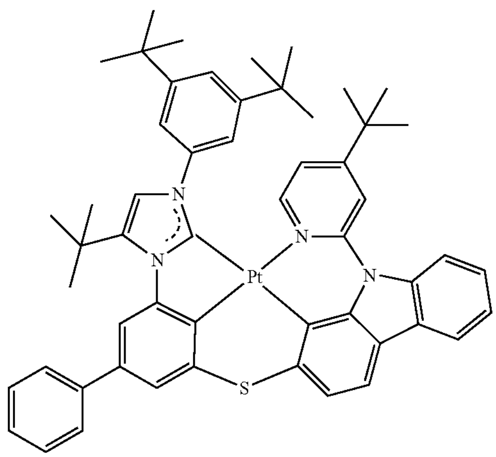
360
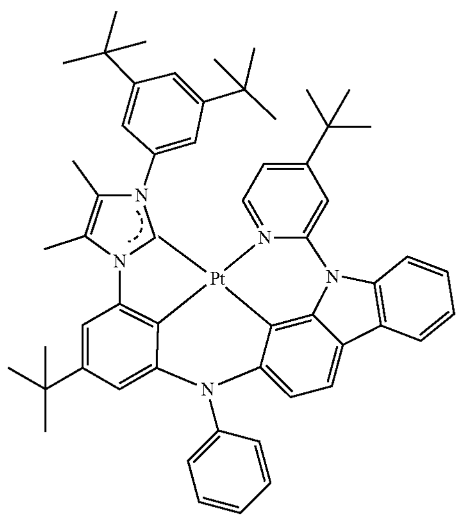
-continued
361
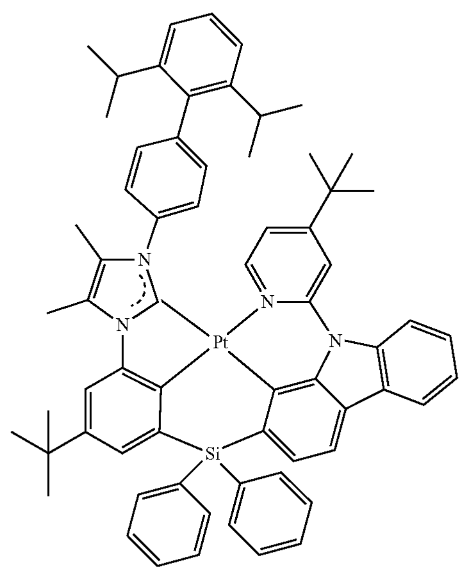
362
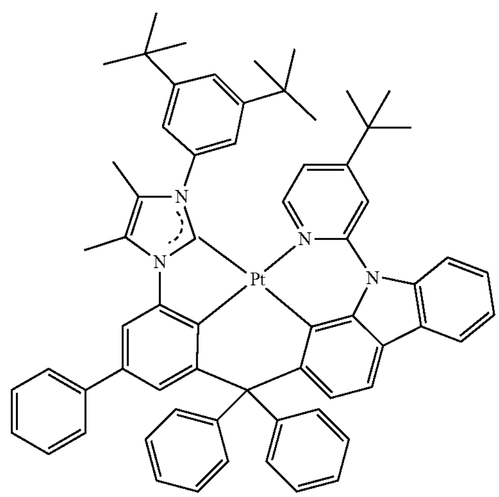
363
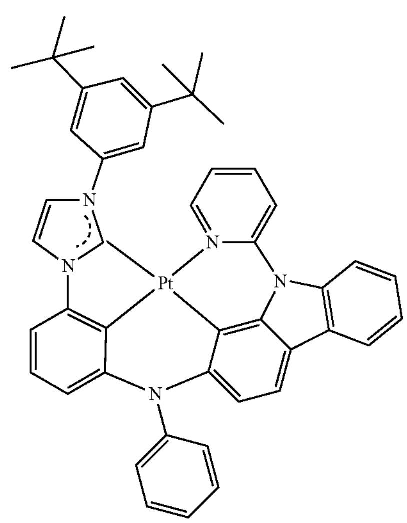

-continued
364
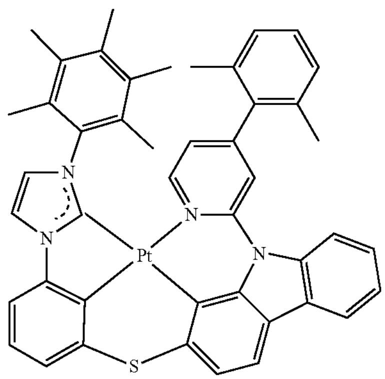
365
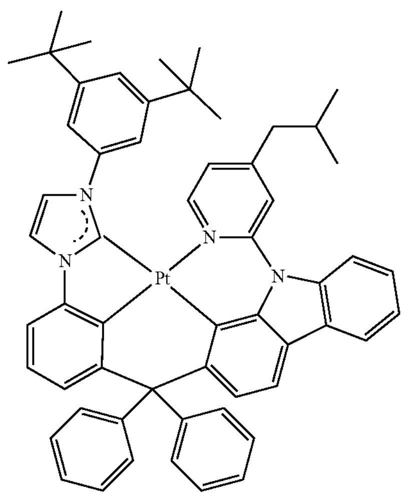
366
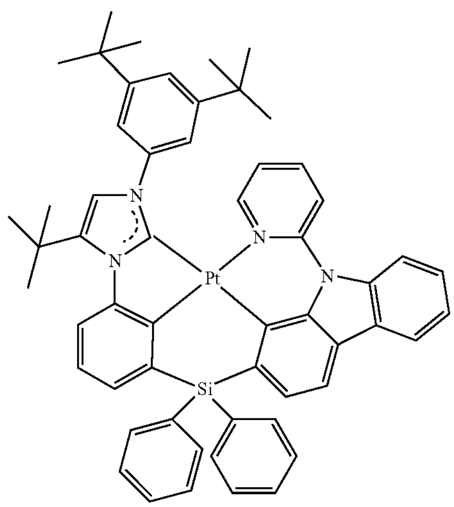
-continued
367
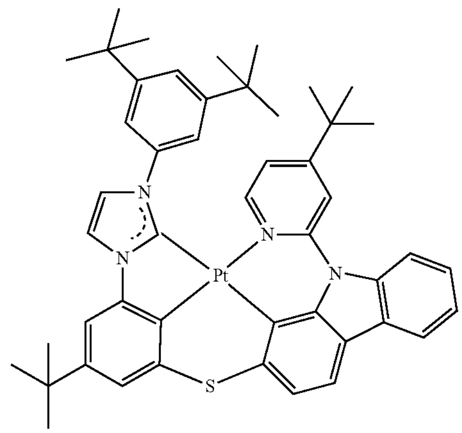
368
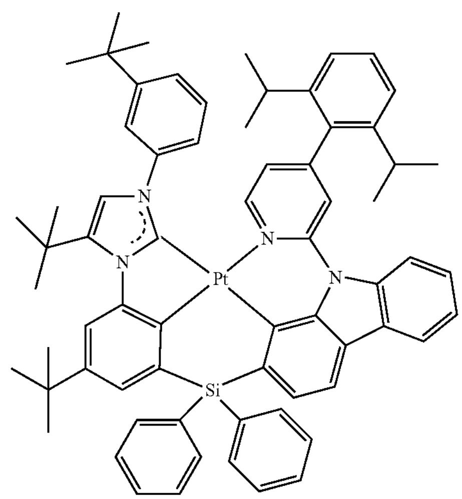
369
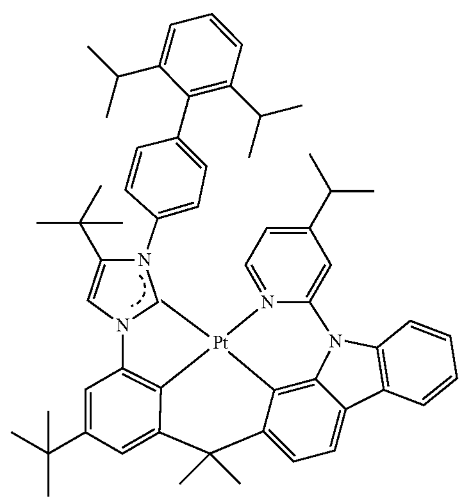

-continued
370
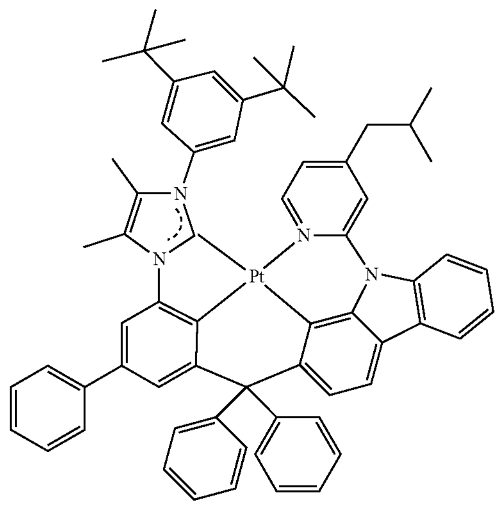
371
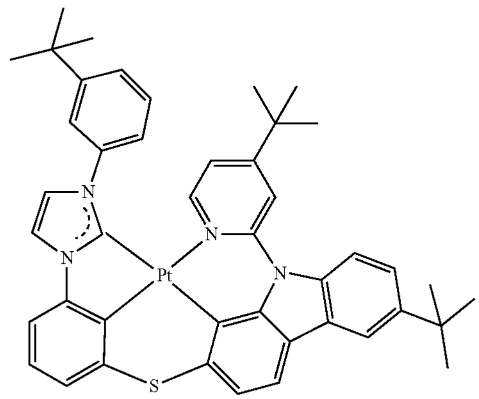
372
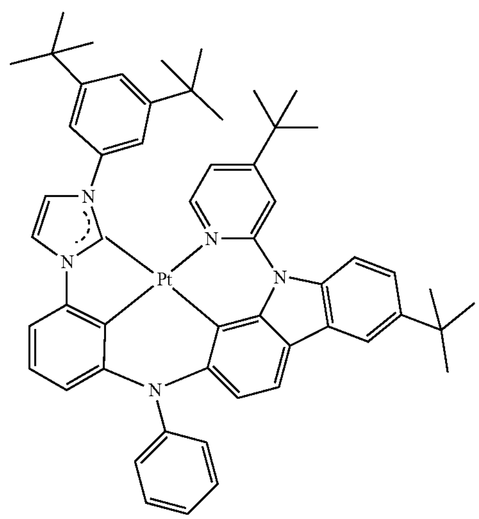
-continued
373
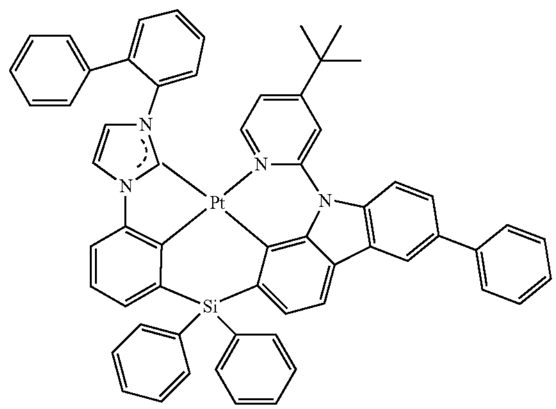
374
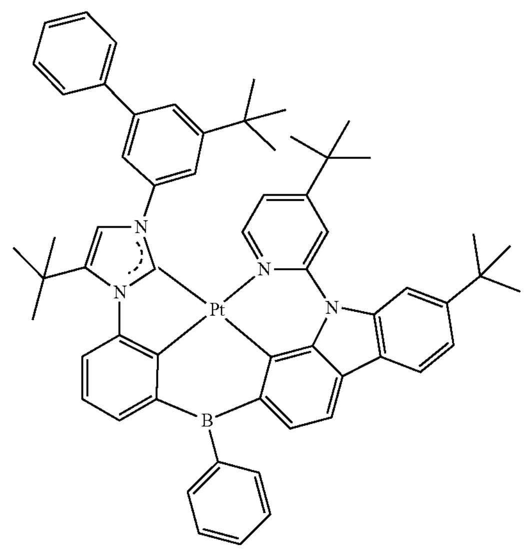
375
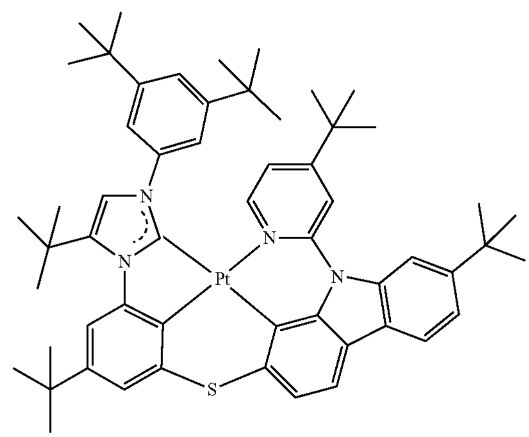

-continued
376
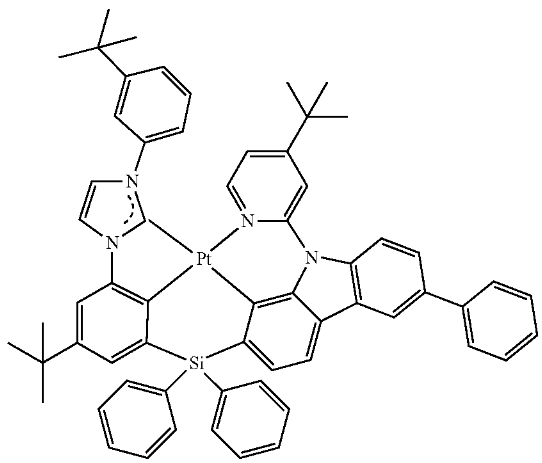
377
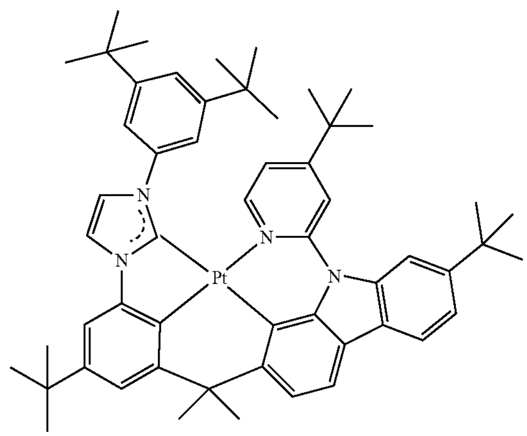
378
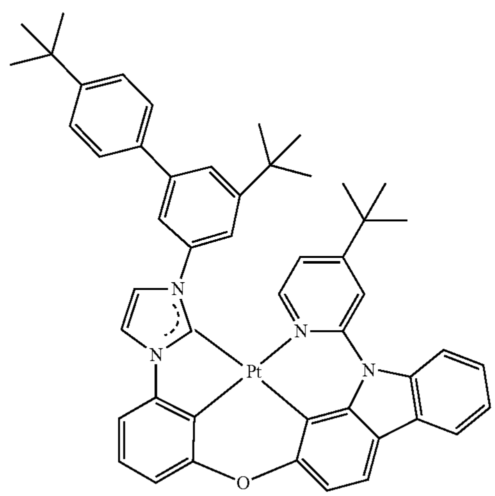
-continued
379
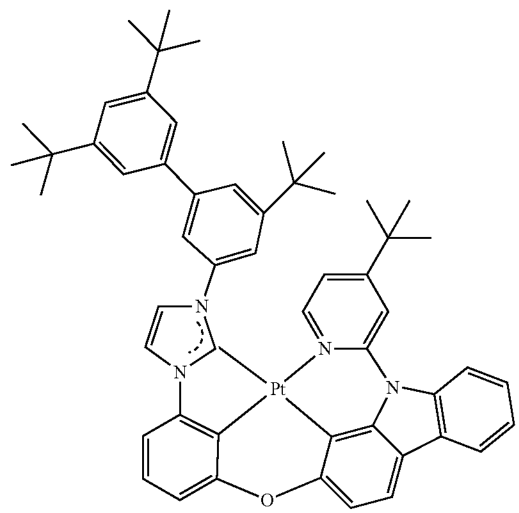
380
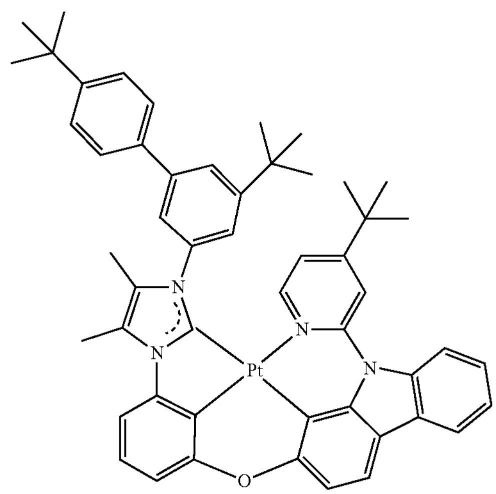
381
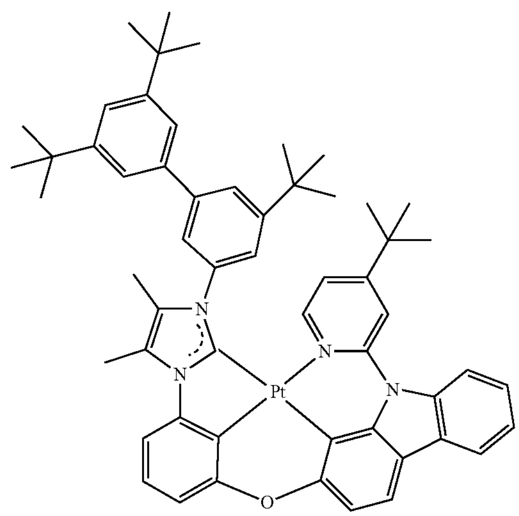

-continued
382
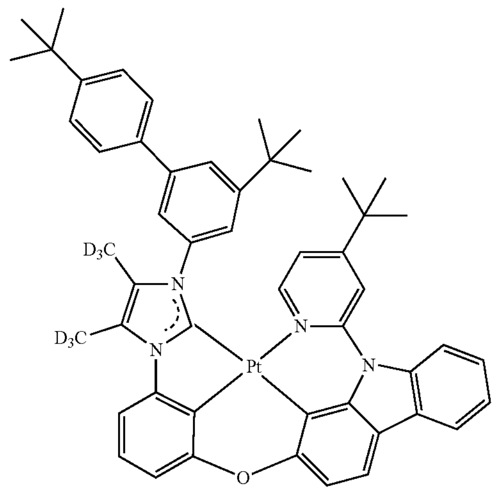
383
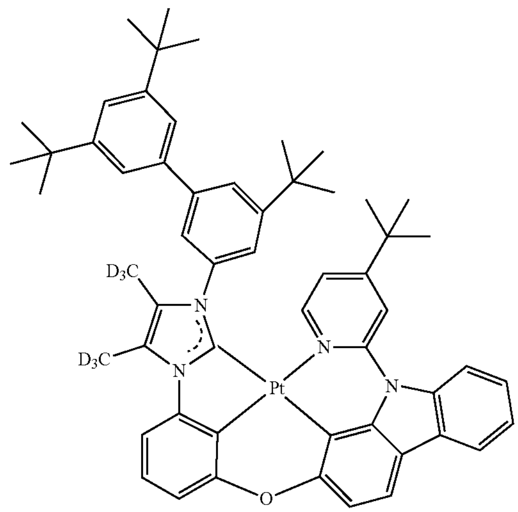
384
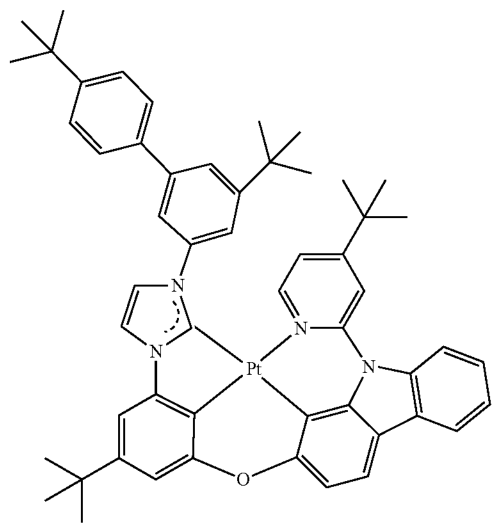
-continued
385
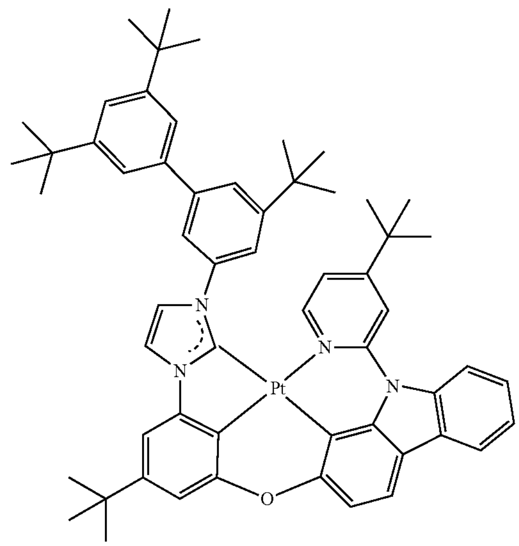
386
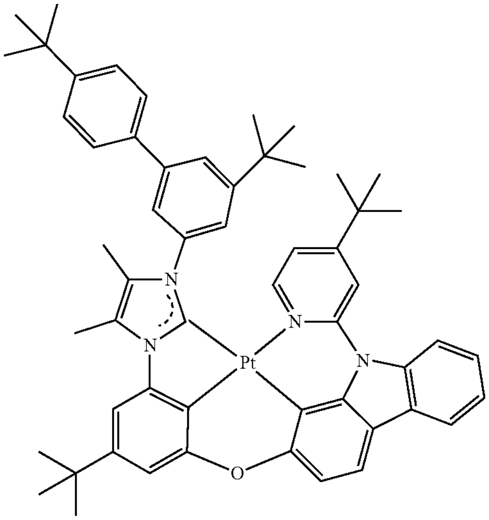
387
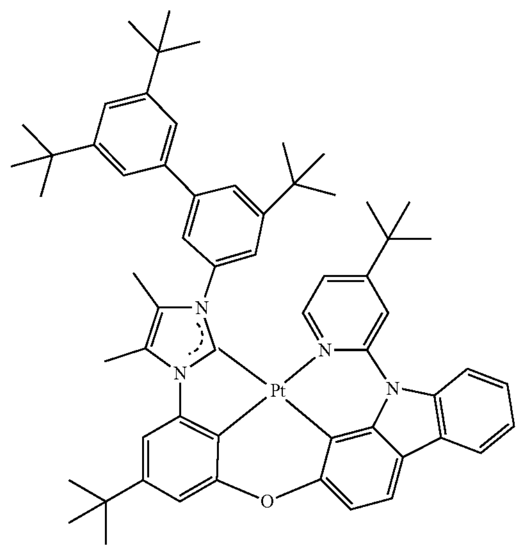

-continued
388
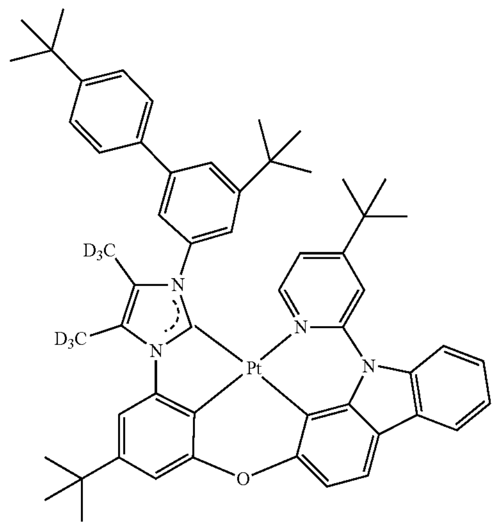
389
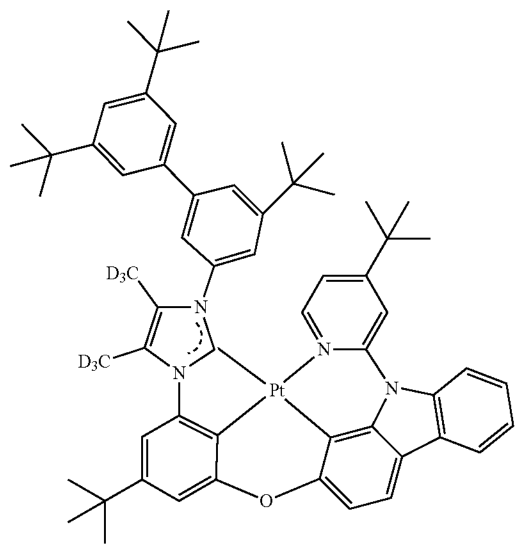
390
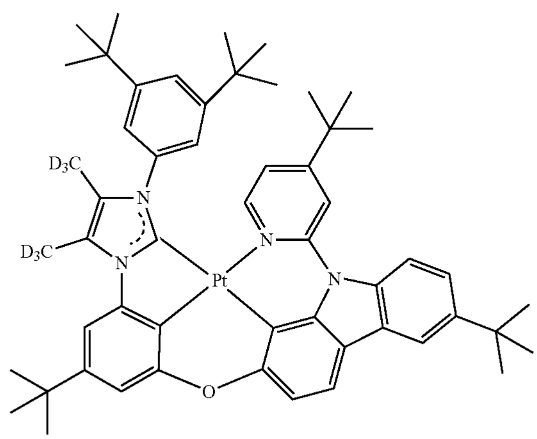
-continued
391
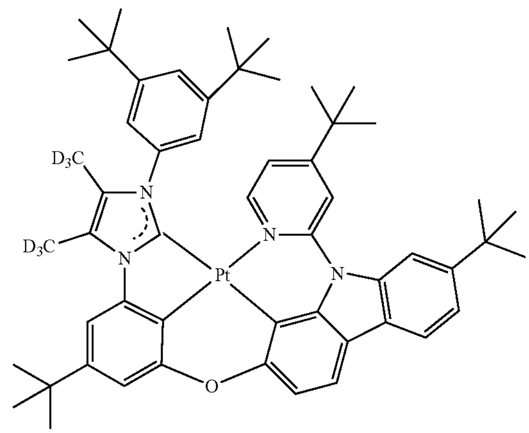
392
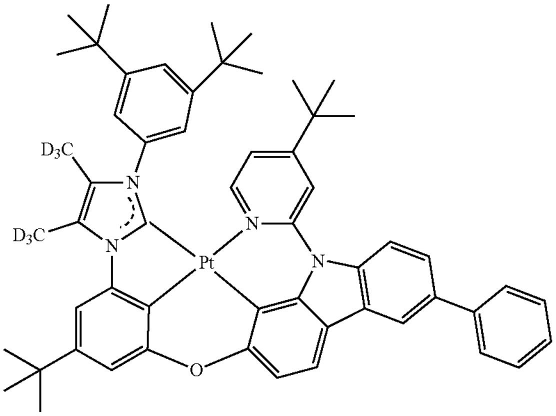
393
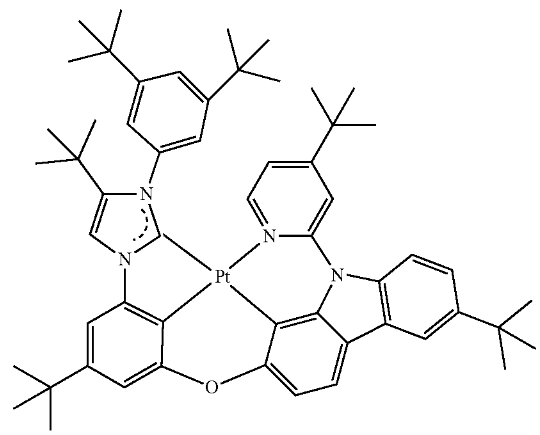

-continued
394
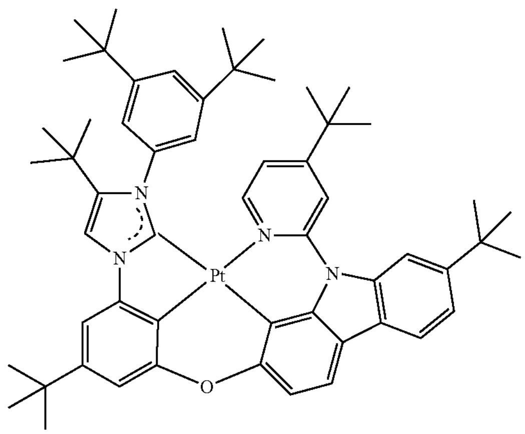
395
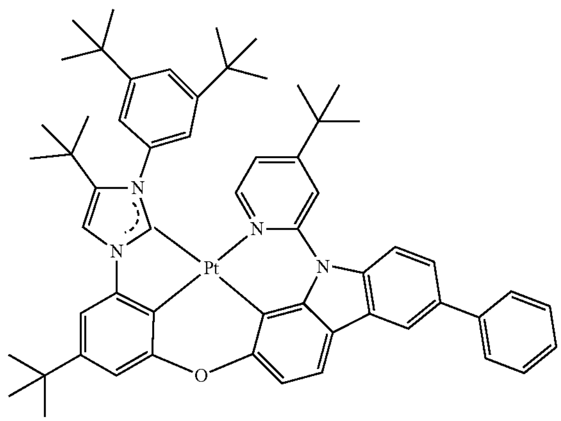
396
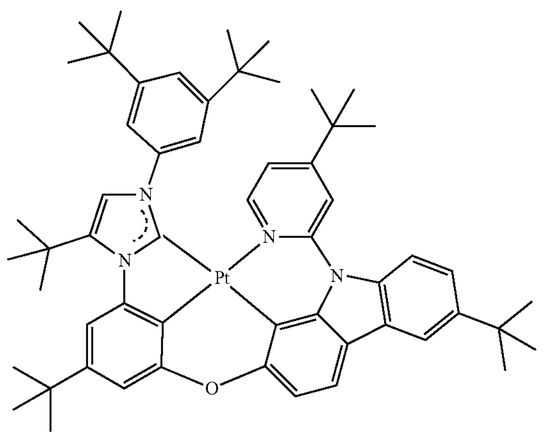
-continued
397
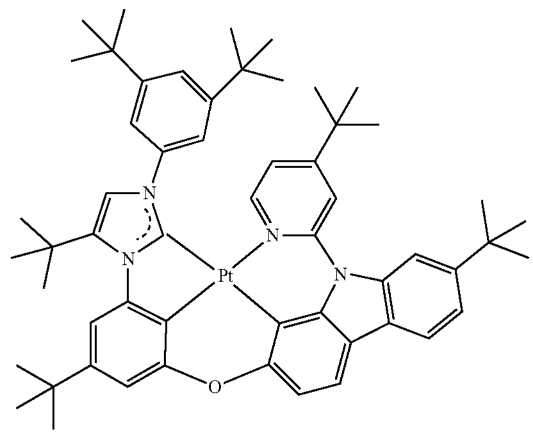
398
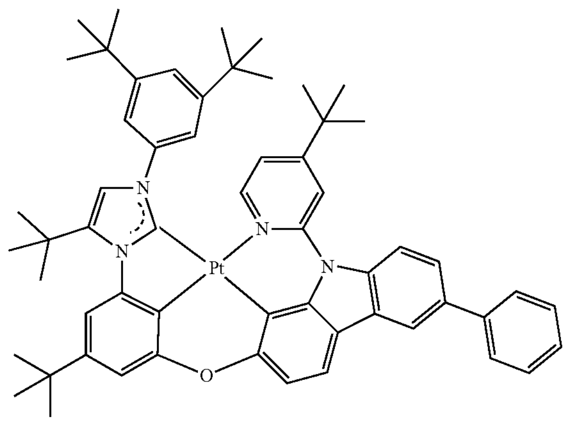
399
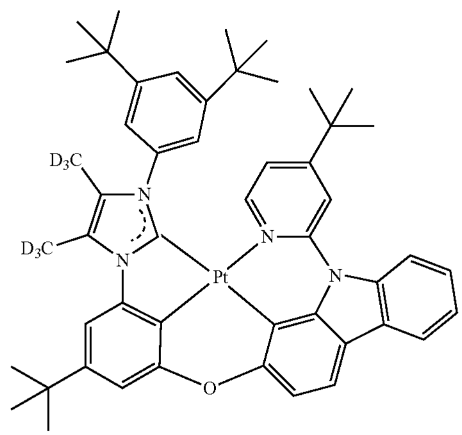

-continued
400
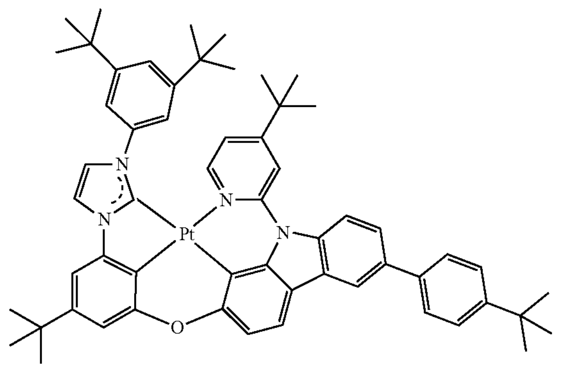
401
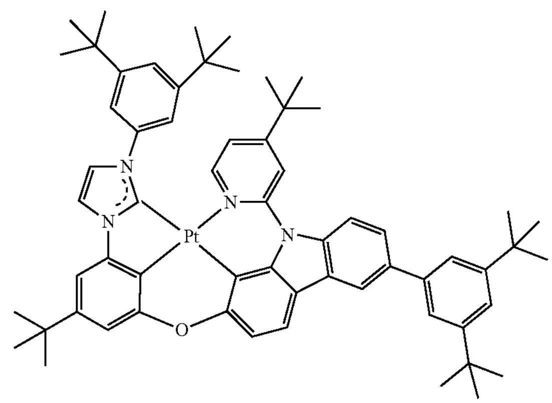
402
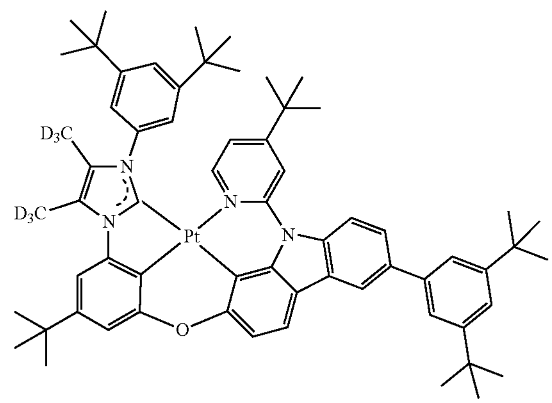
403
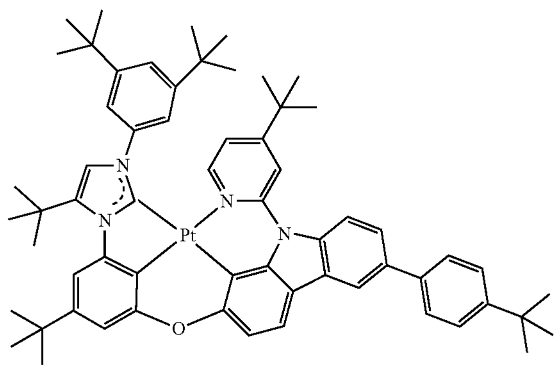
-continued
404
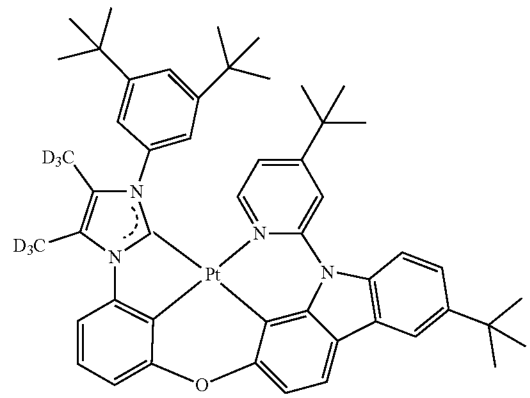
405
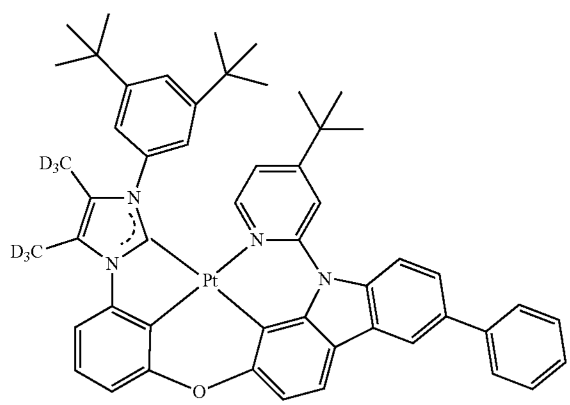
406
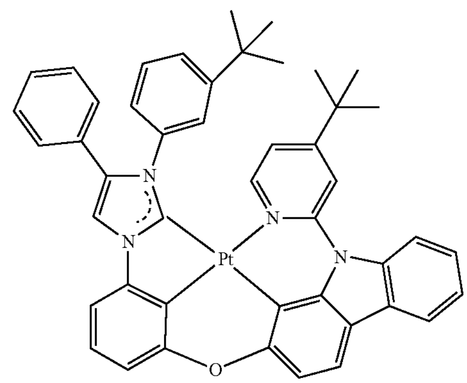
407
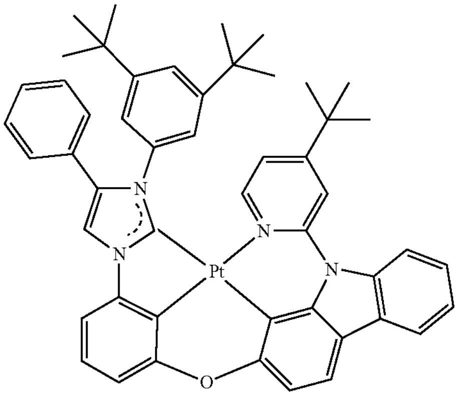

-continued
408
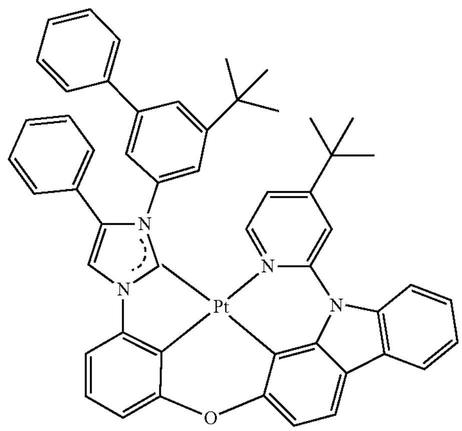
409
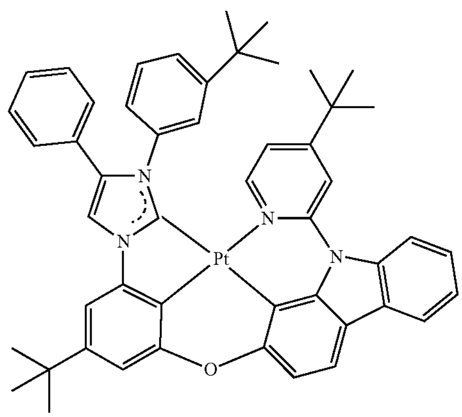
410
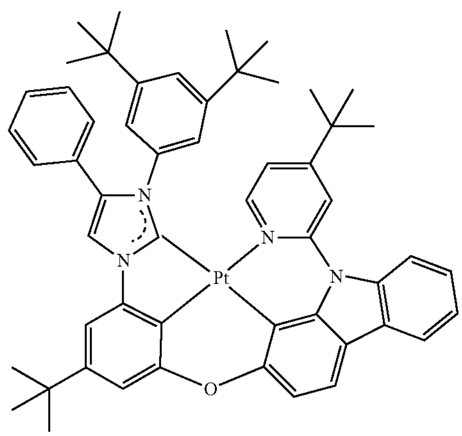
-continued
411
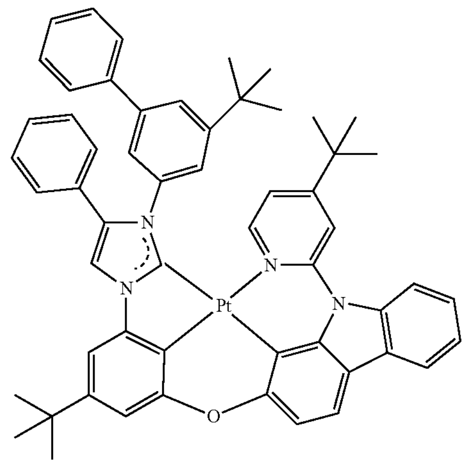
412
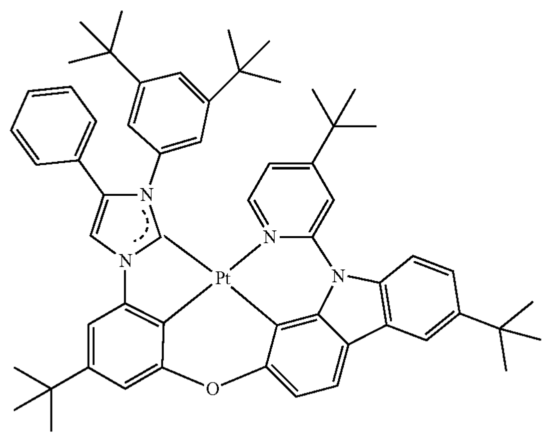
413
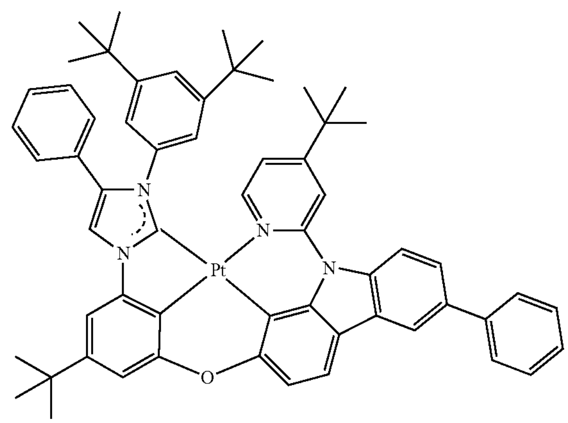

414
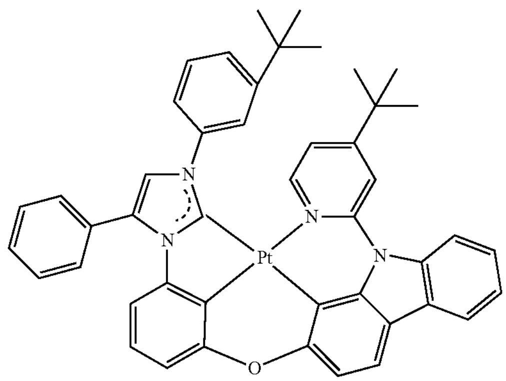
415
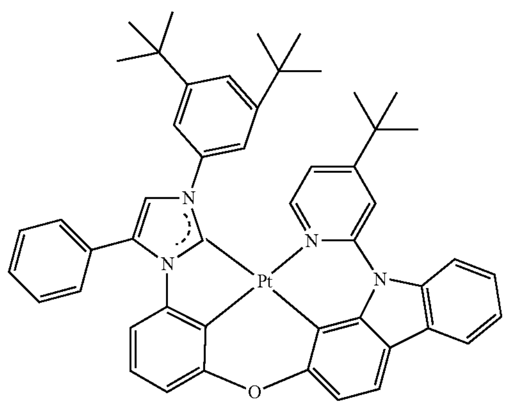
416
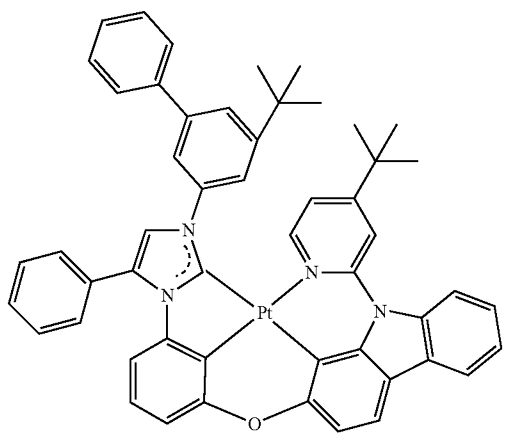
417
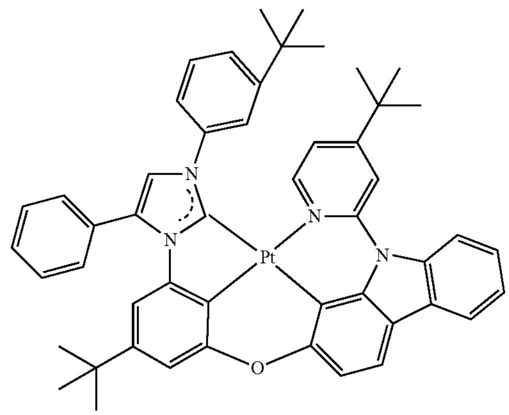
418
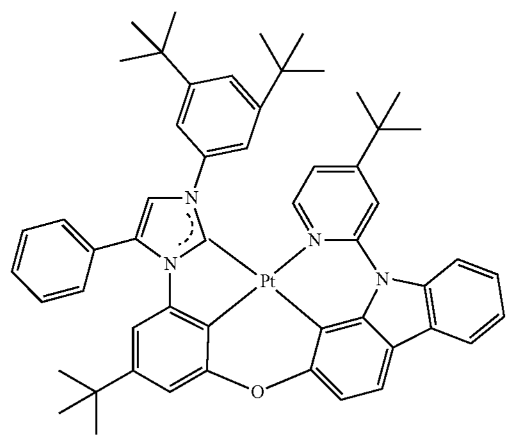
419
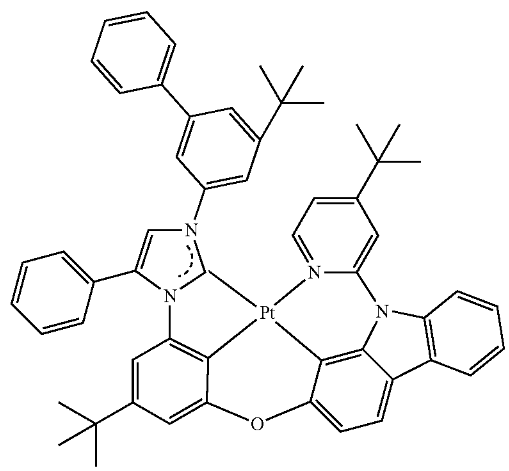

-continued
420
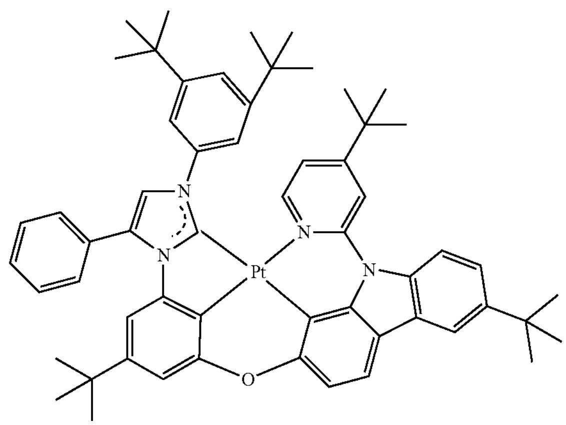
421
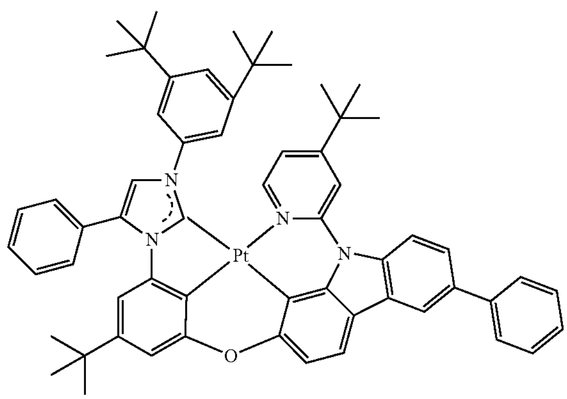
422
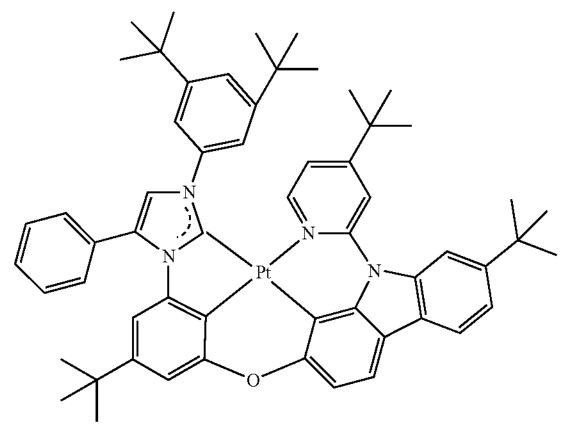
-continued
423
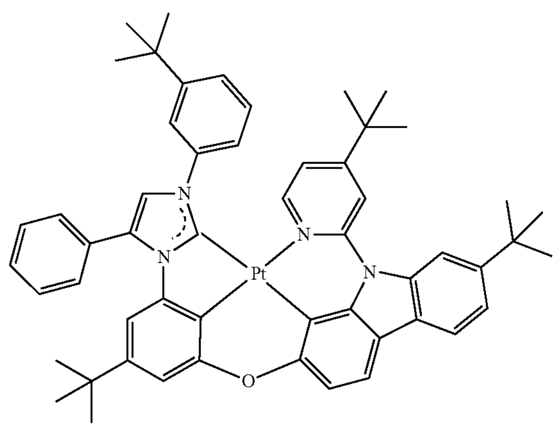
424
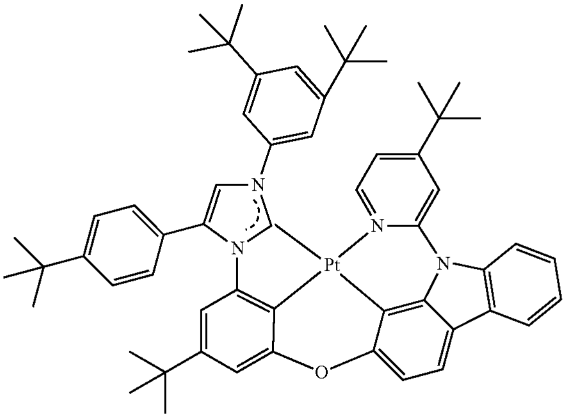
425
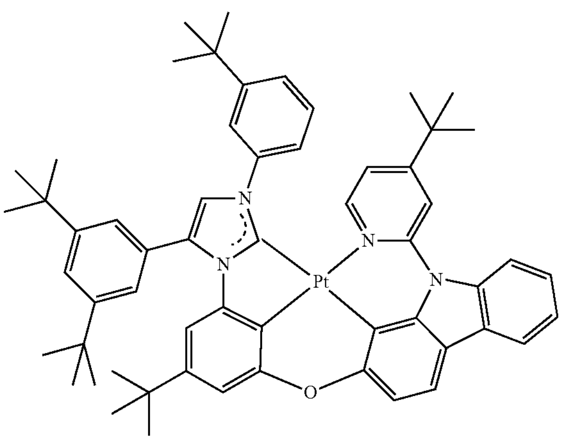

-continued
426
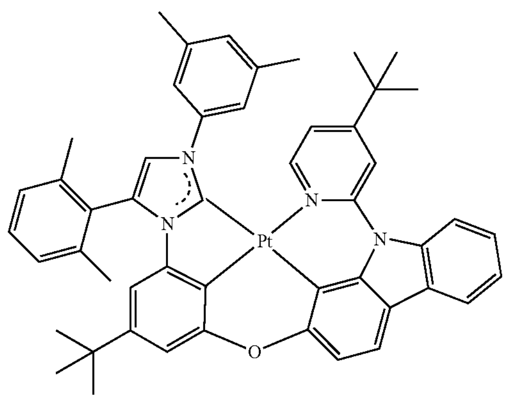
427
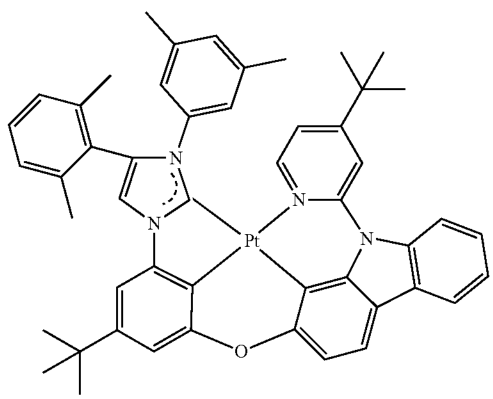
428
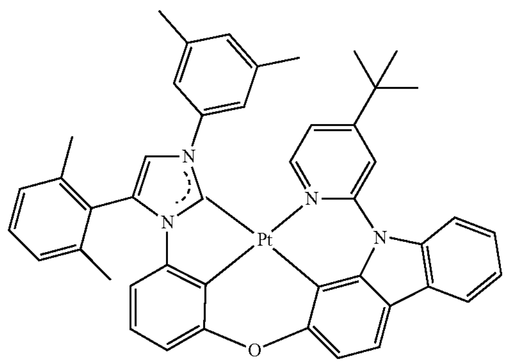
Group X
1
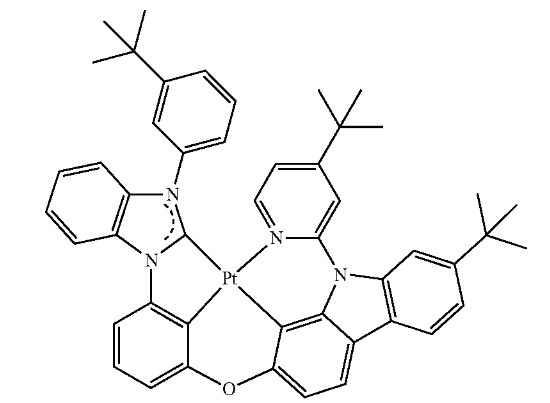
2
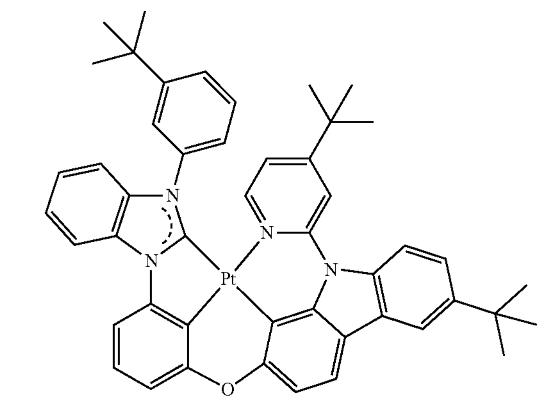
3
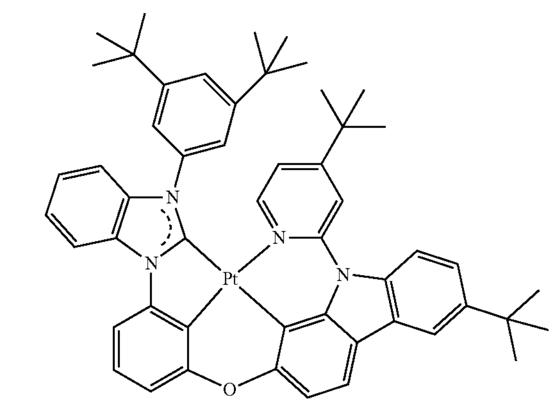
4
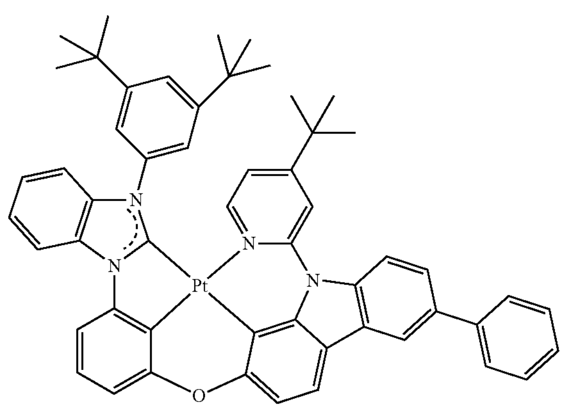

-continued
5
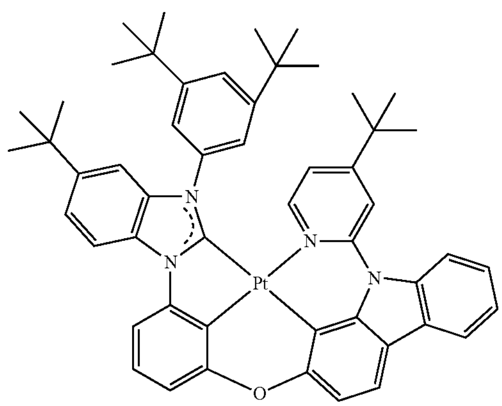
6
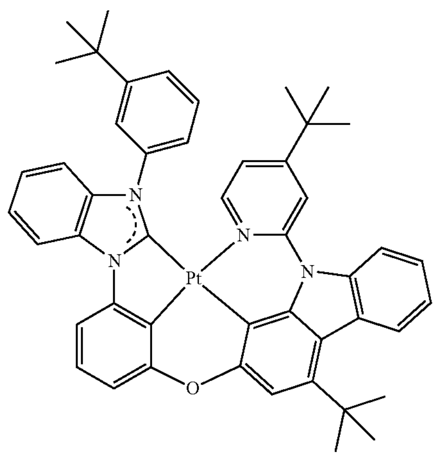
7
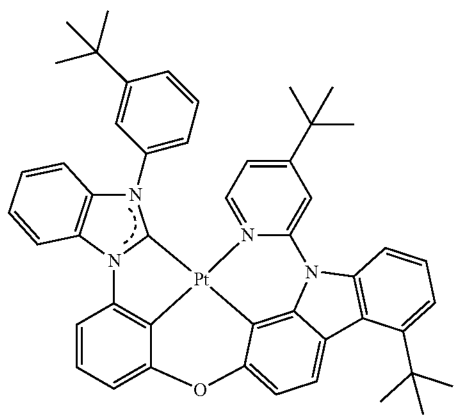
-continued
8
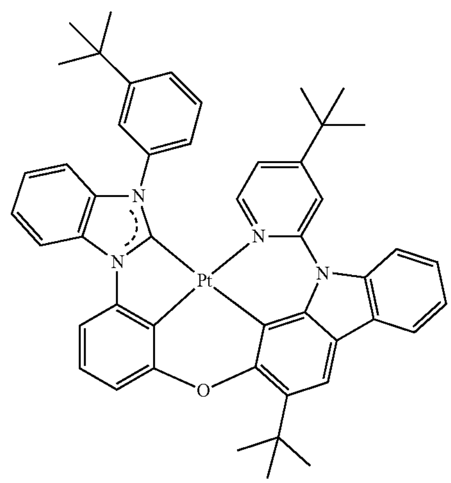
9
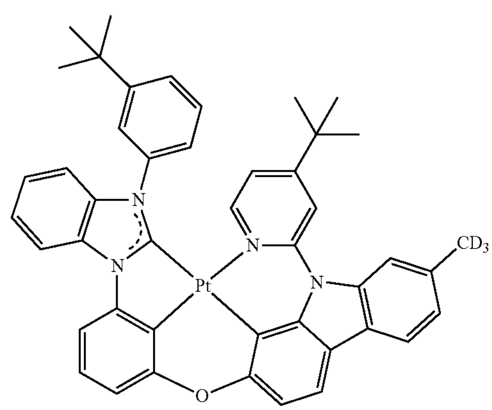
10
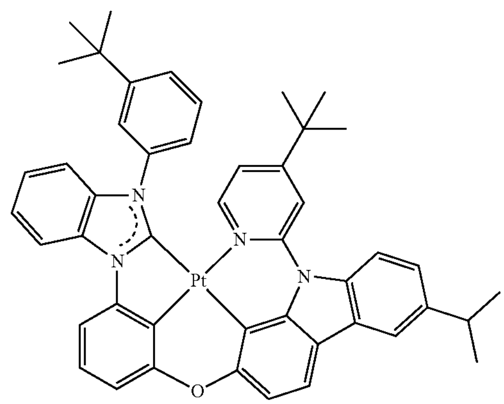

-continued
11
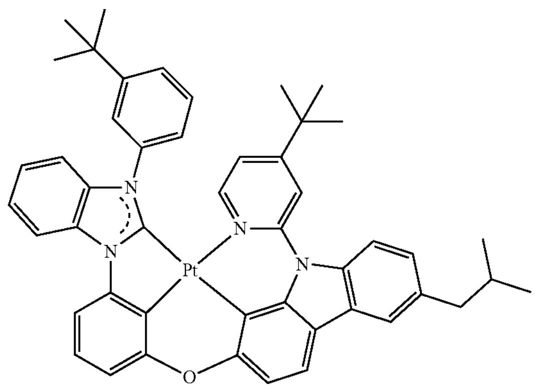
12
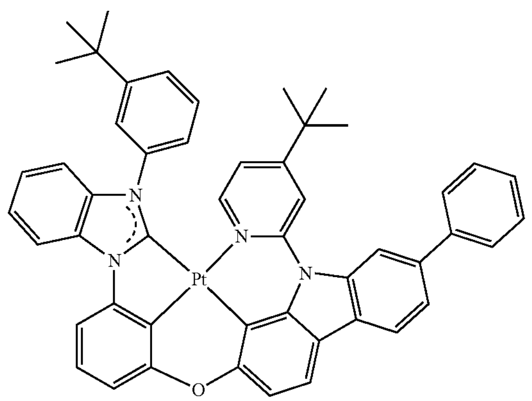
13
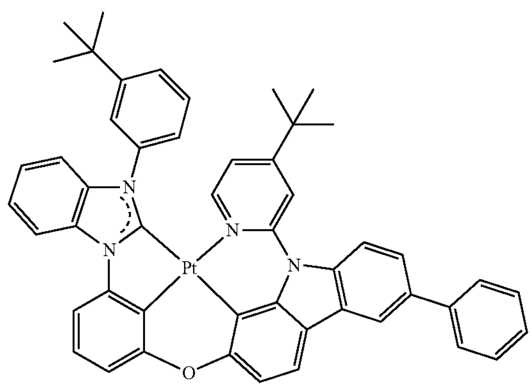
-continued
14
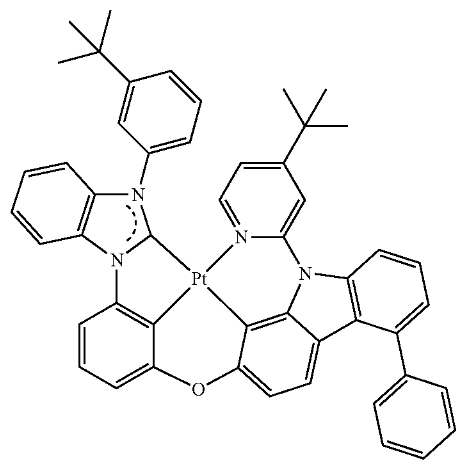
15
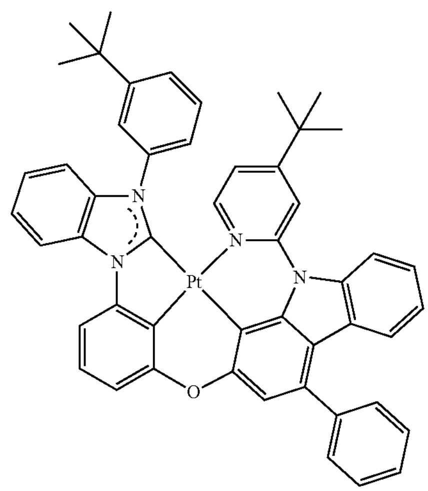
16
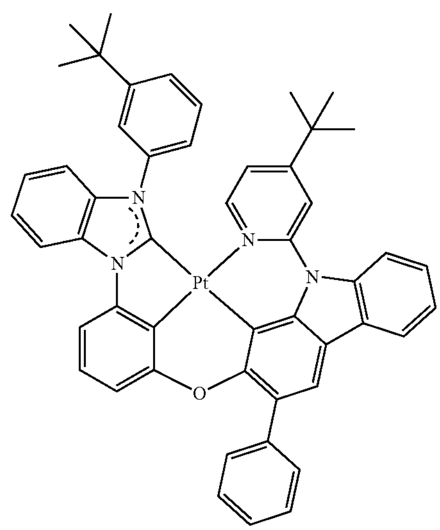

-continued
17
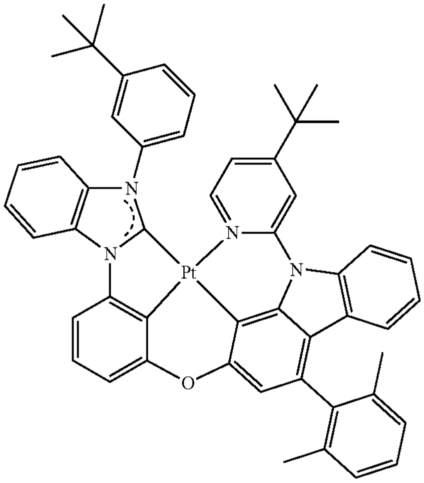
18
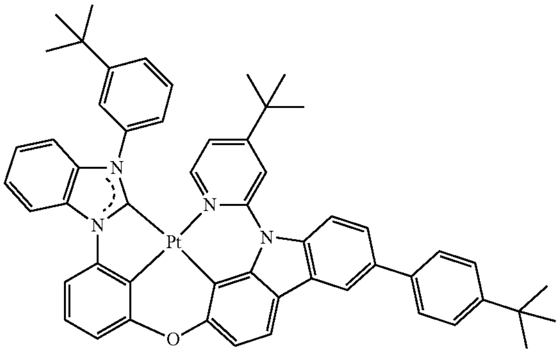
19
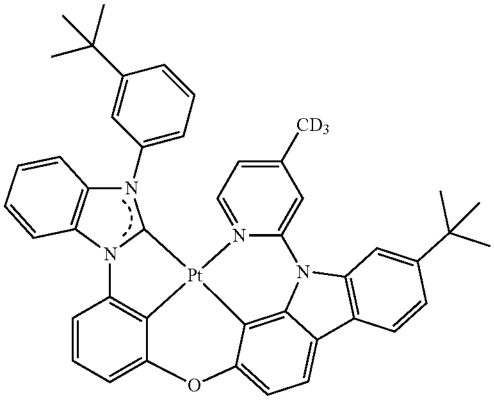
-continued
20
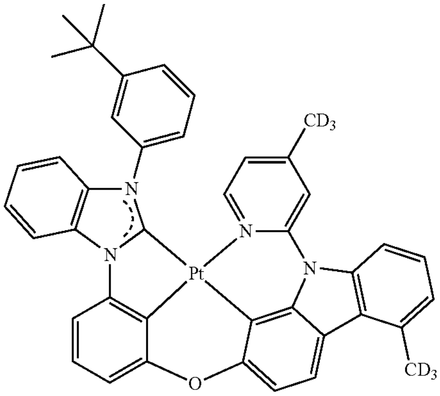
21
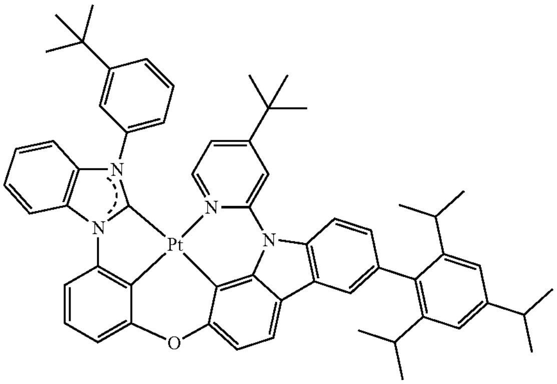
22
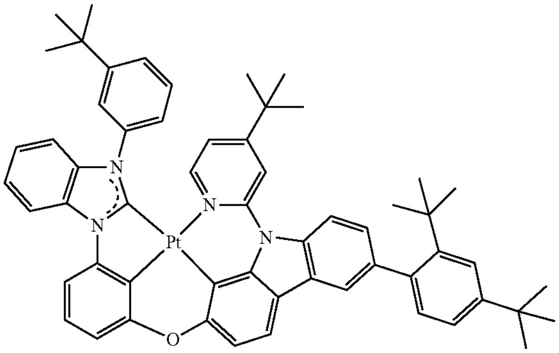
23
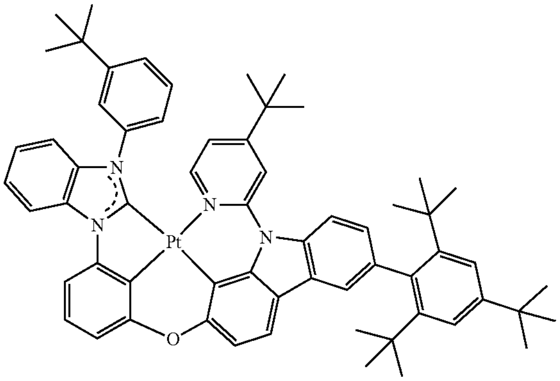

-continued
24
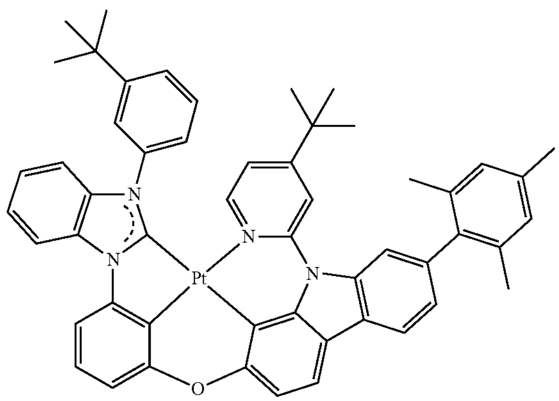
25
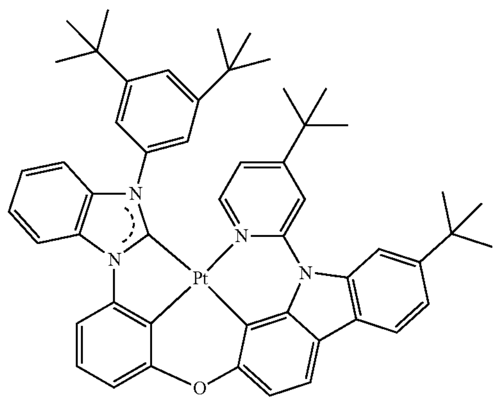
26
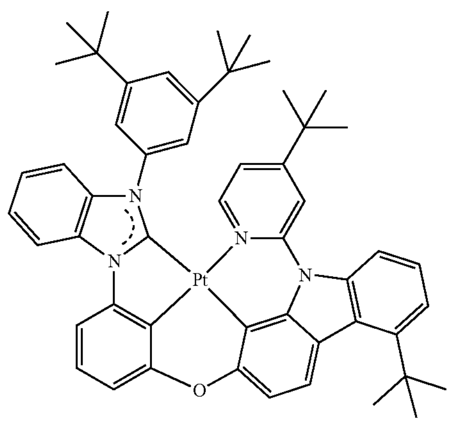
27
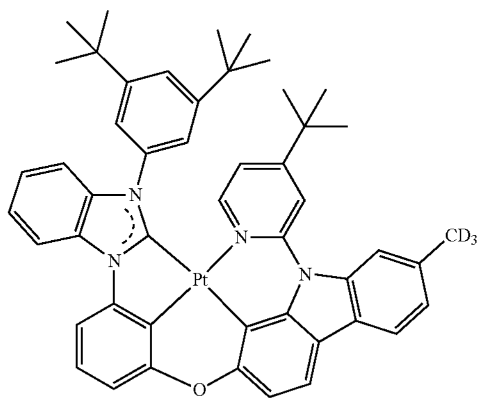
-continued
28
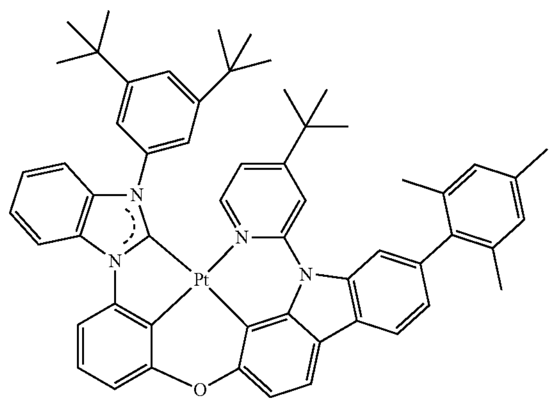
29
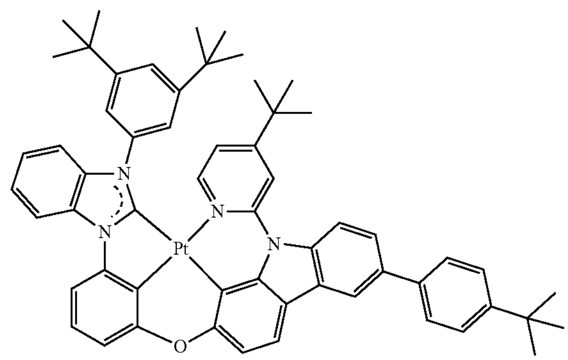
30
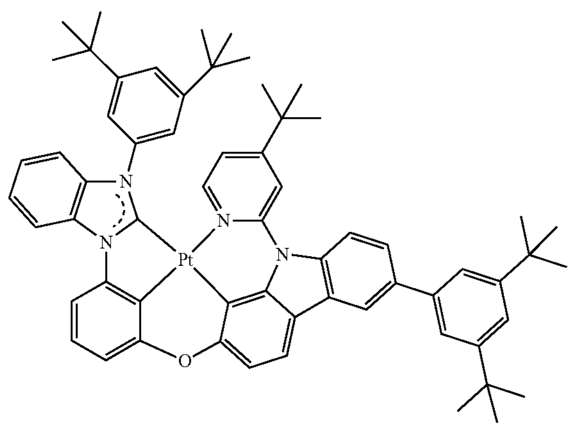

-continued
31
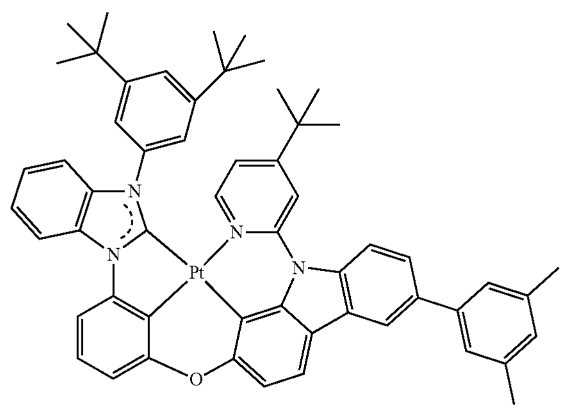
32
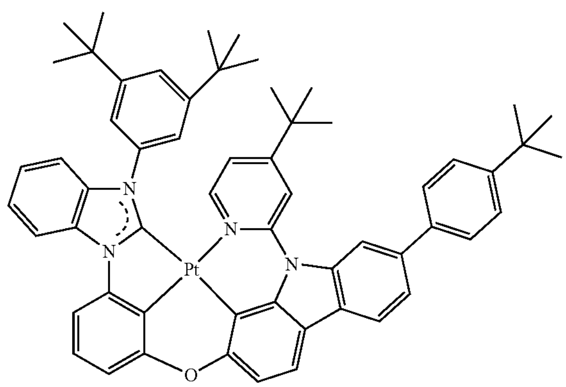
33
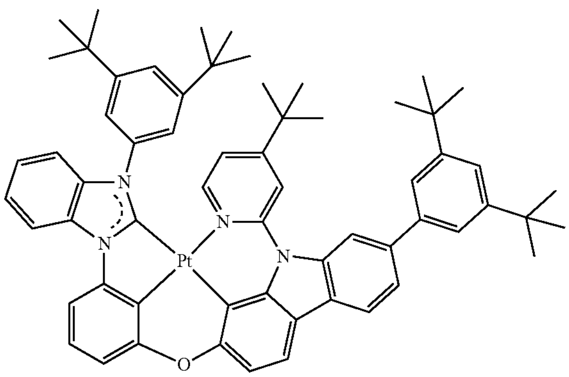
34
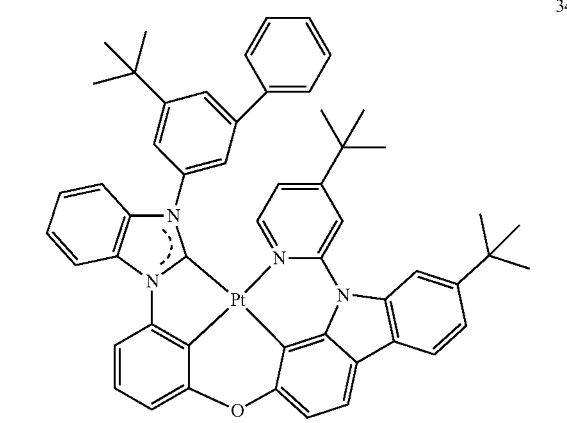
-continued
35
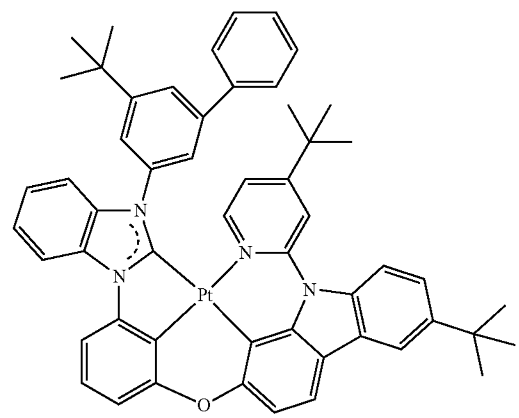
36
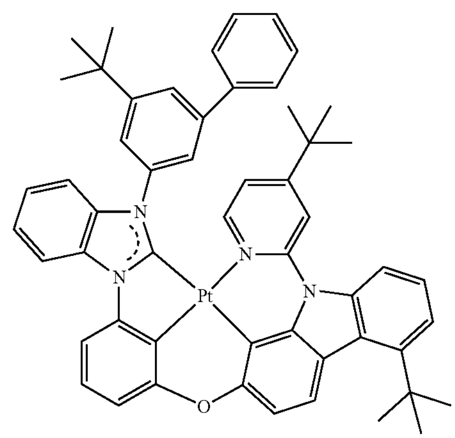
37
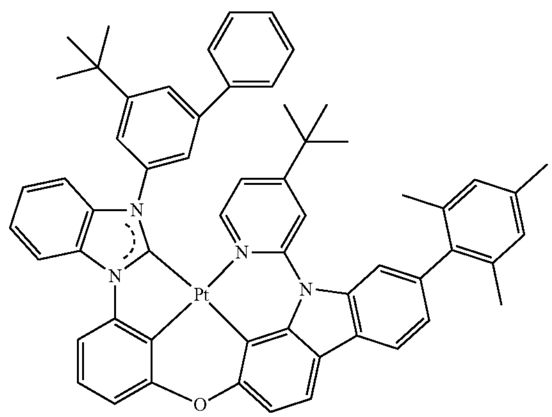

-continued
38
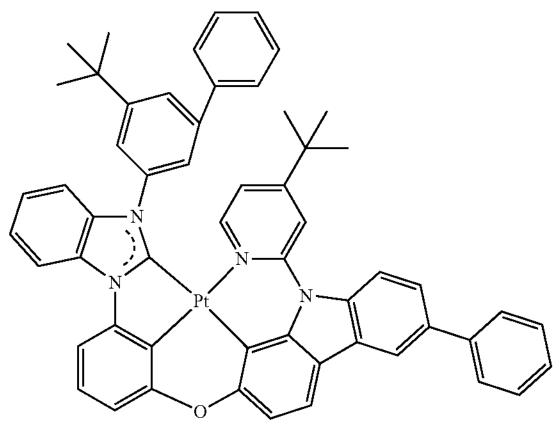
39
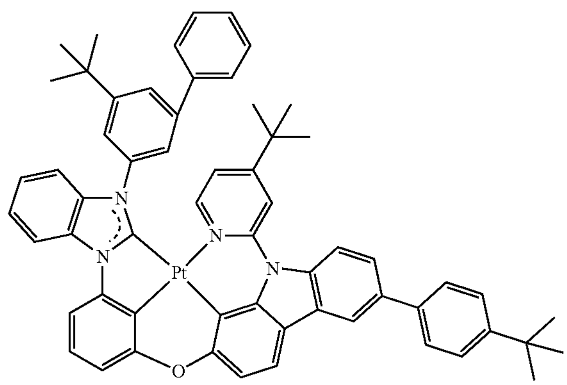
40
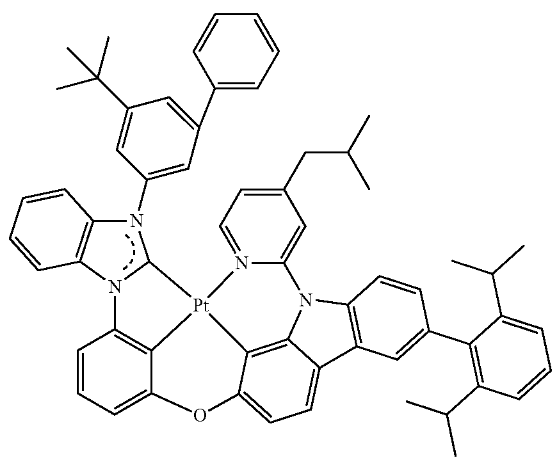
-continued
41
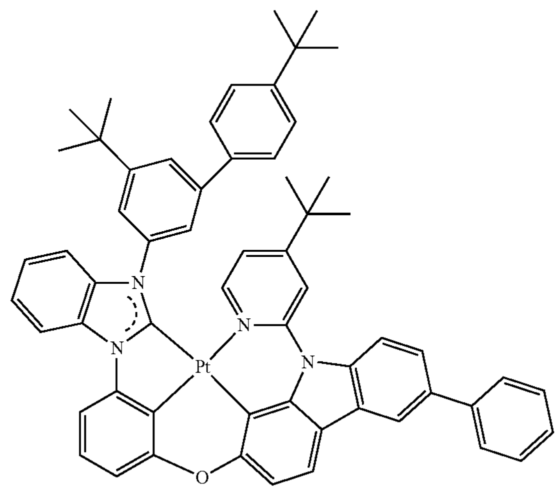
42
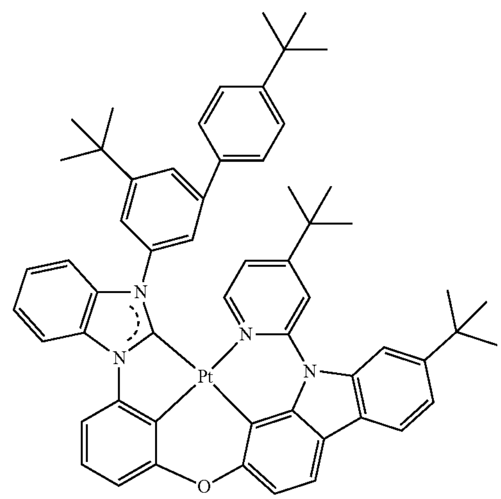
43
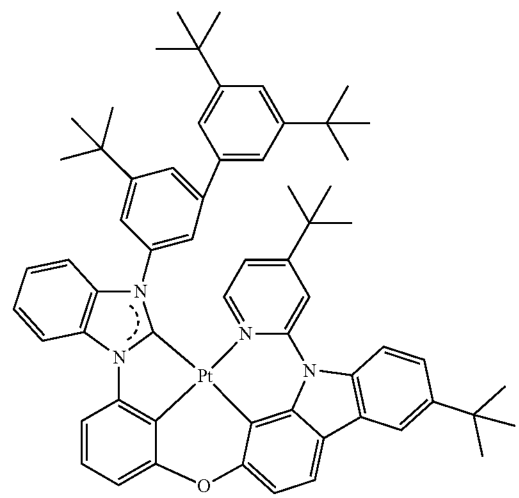

-continued
44
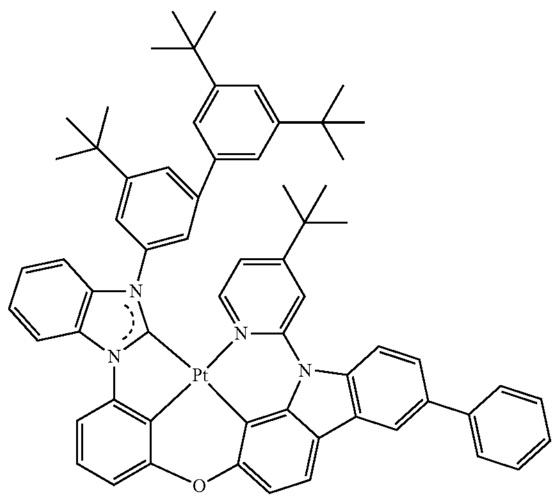
45
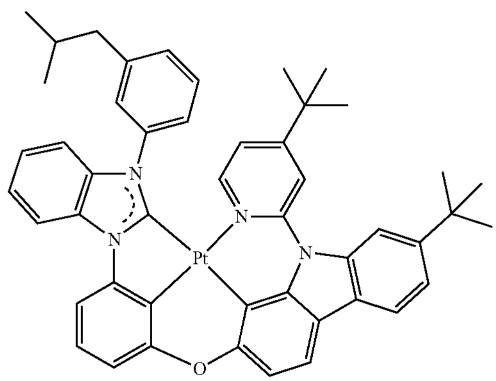
46
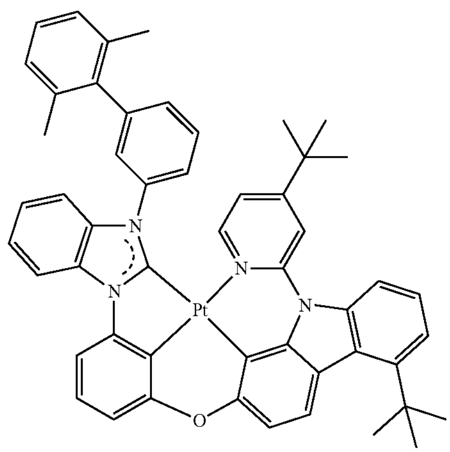
-continued
47
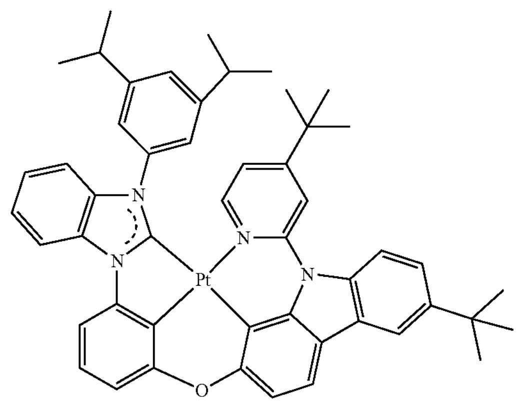
48
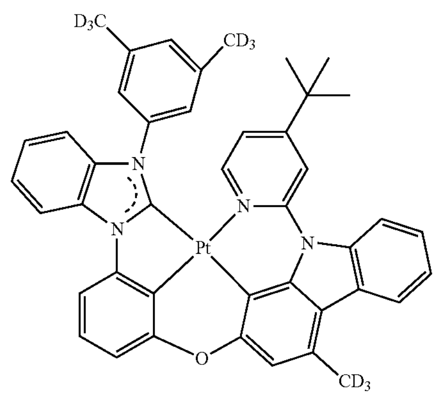
49
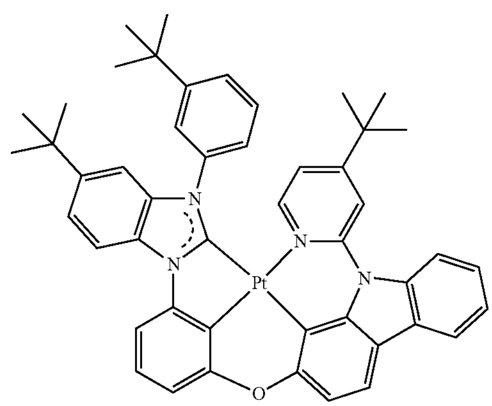
50
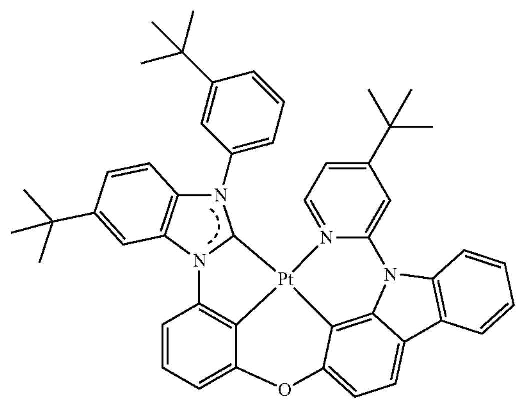

-continued
51
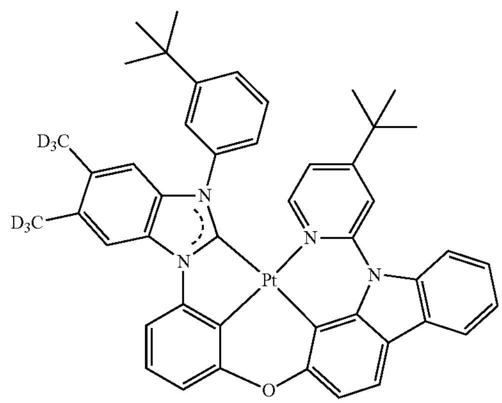
52
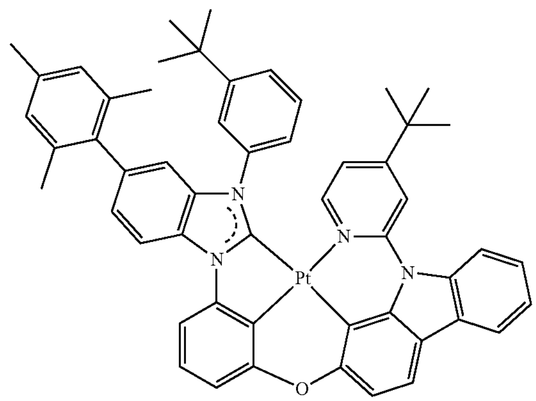
53
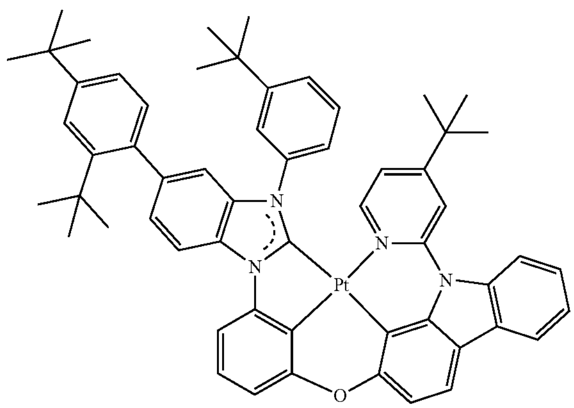
-continued
54
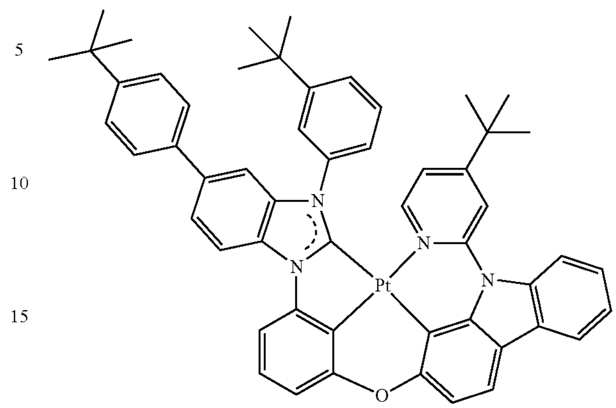
55
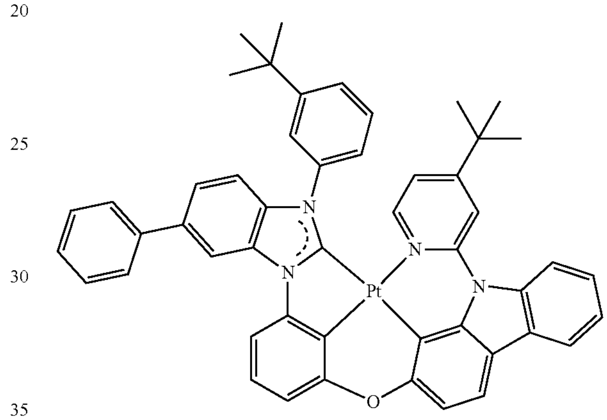
56
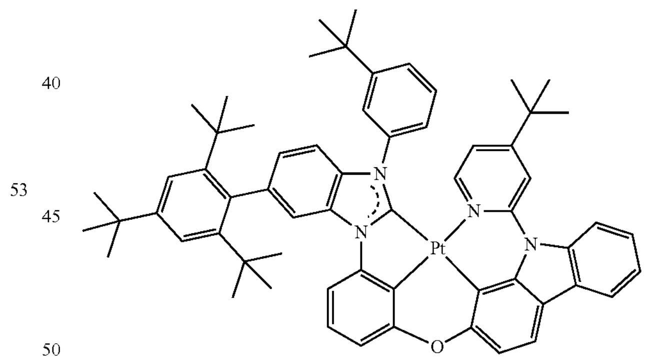
57
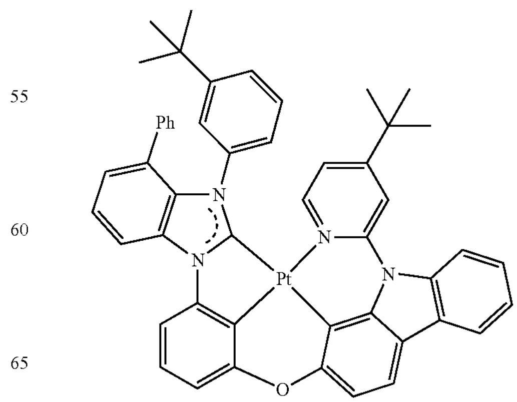

-continued
58
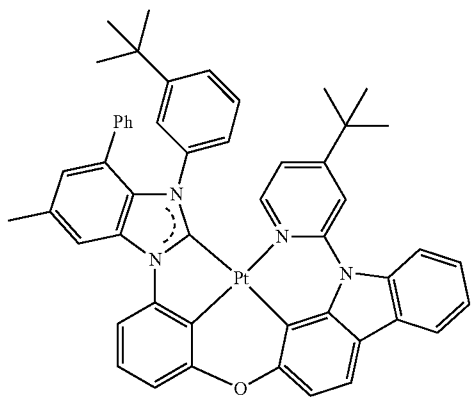
59
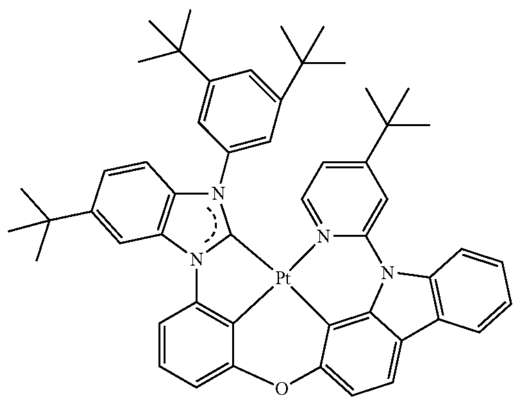
60
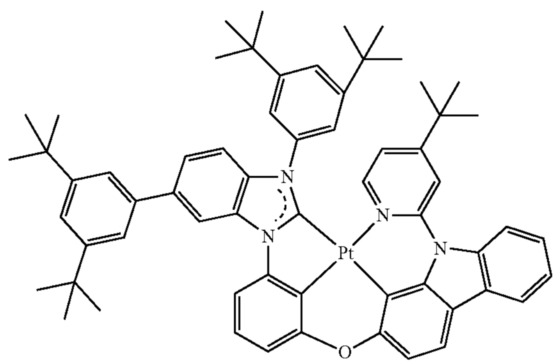
61
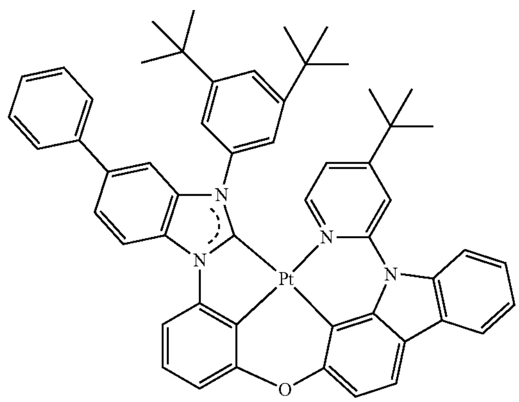
-continued
62
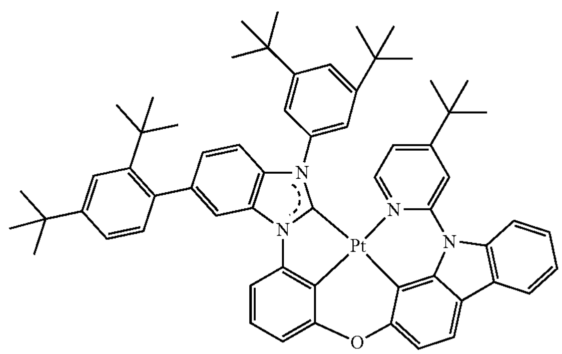
63
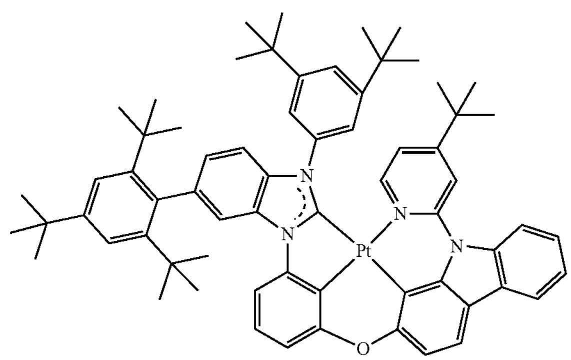
64
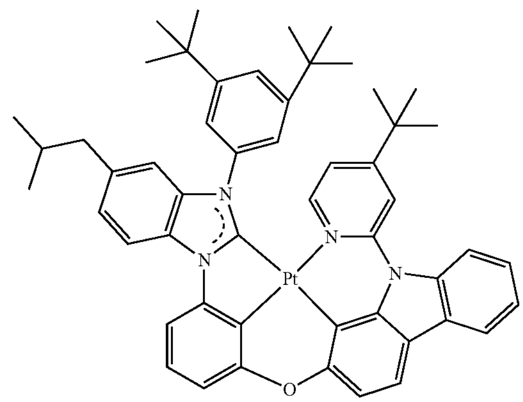
65
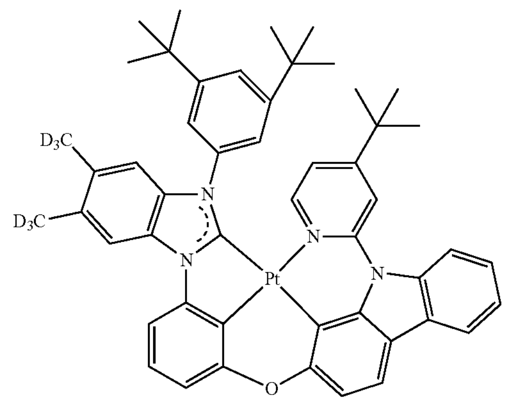

-continued
66
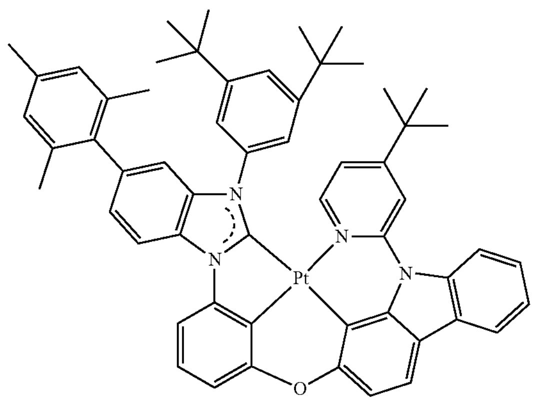
67
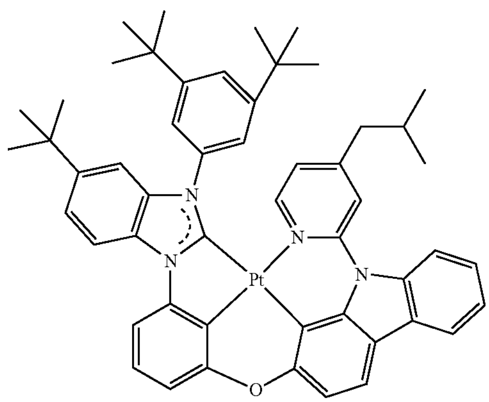
68
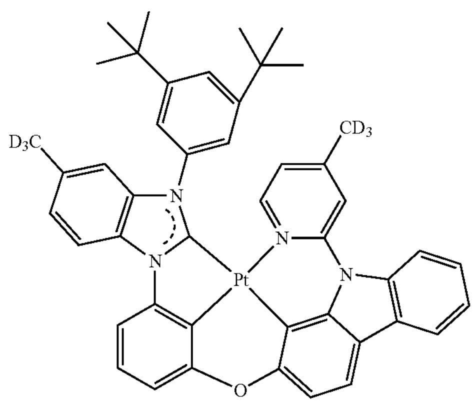
69
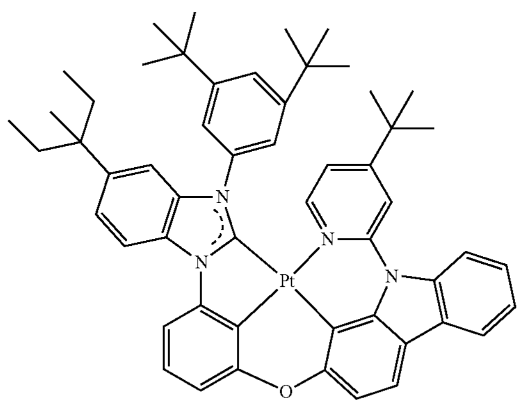
-continued
70
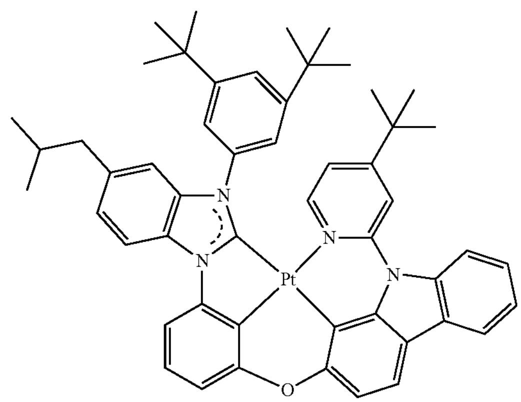
71
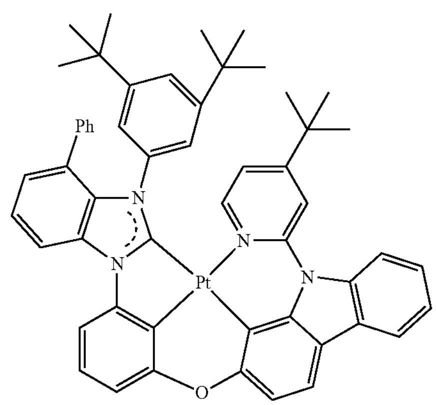
72
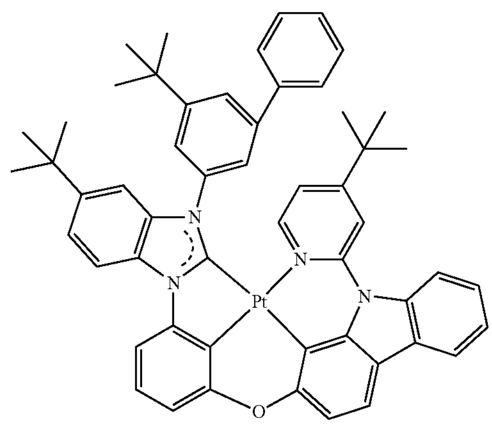

-continued
73
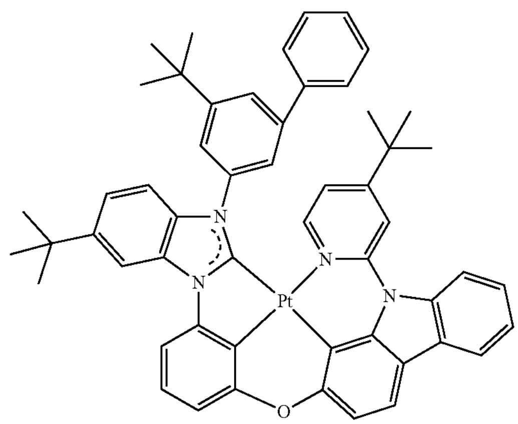
74
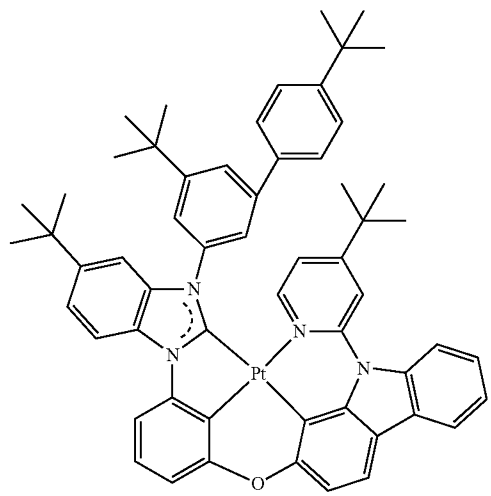
75
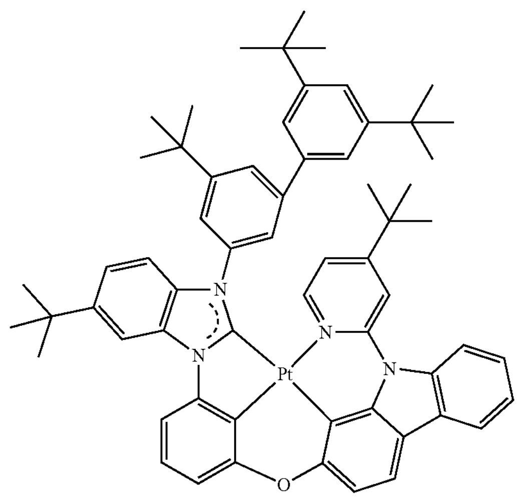
-continued
76
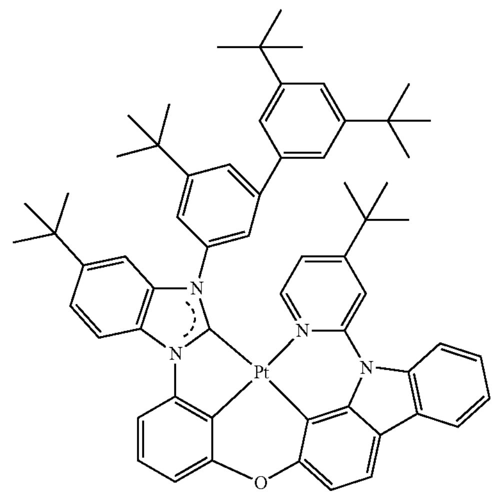
77
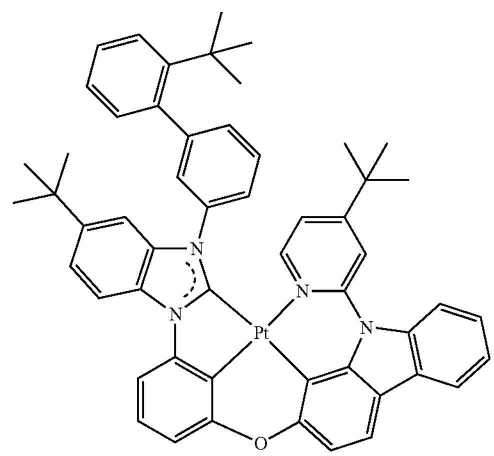
78
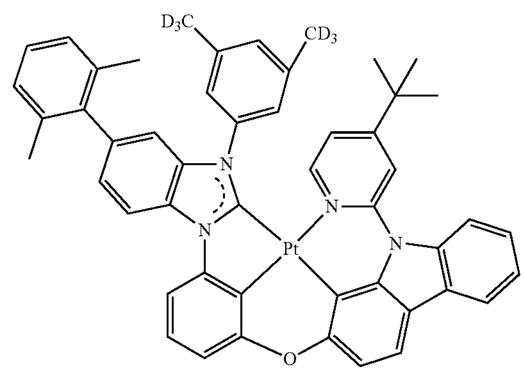

-continued
79
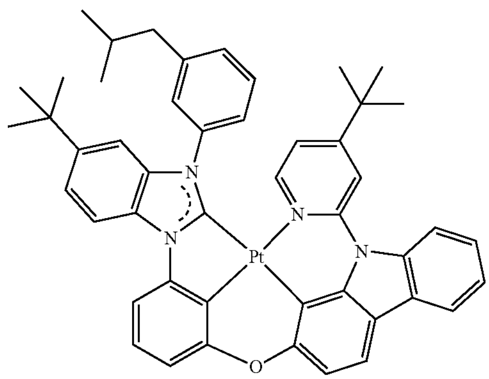
80
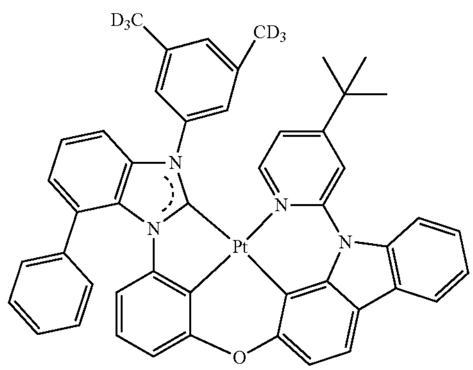
81
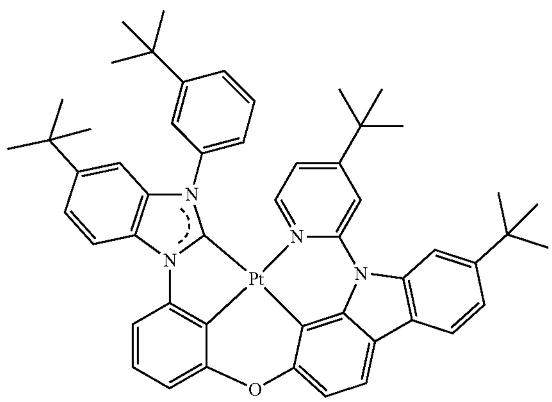
82
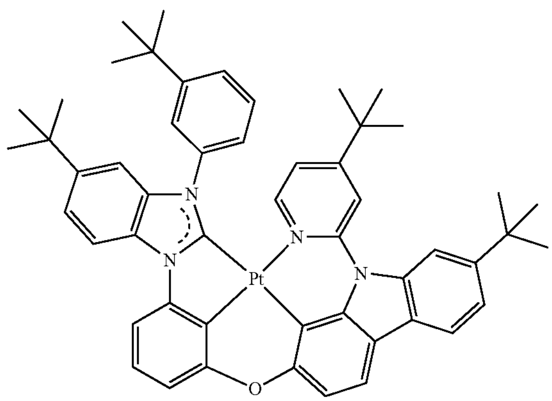
-continued
83
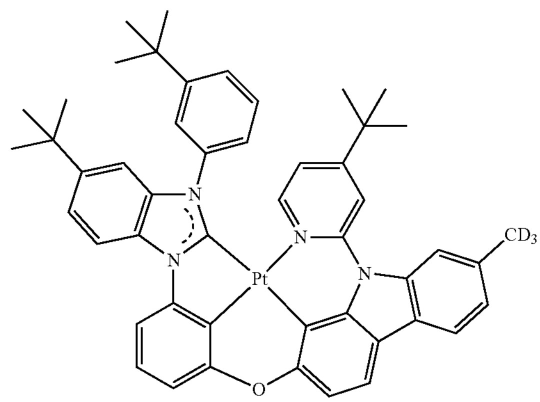
84
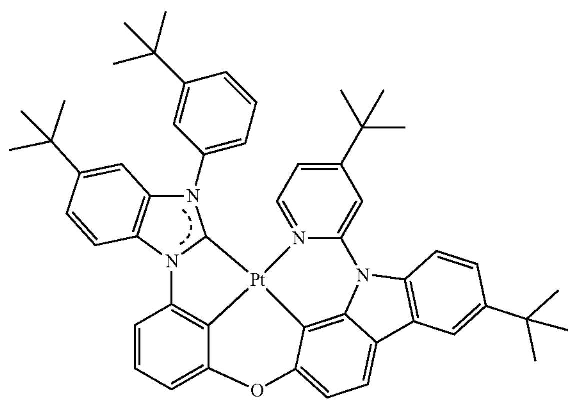
85
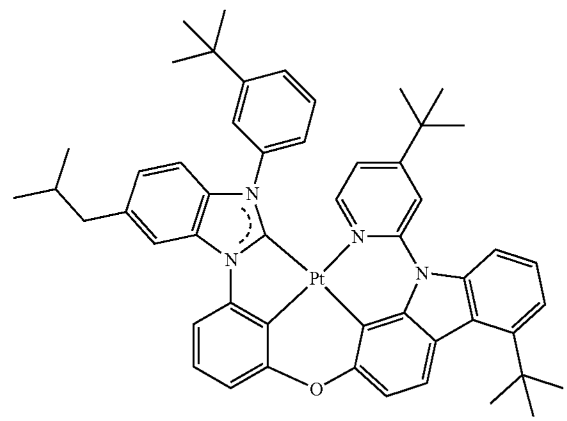
86
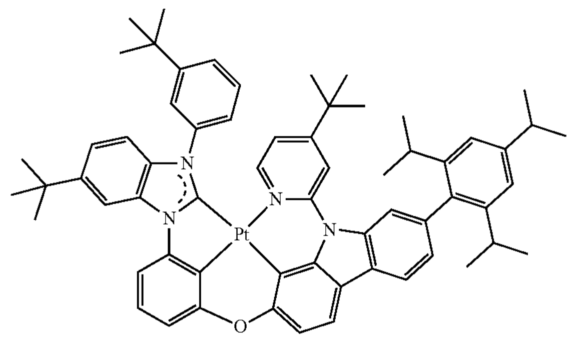

-continued
87
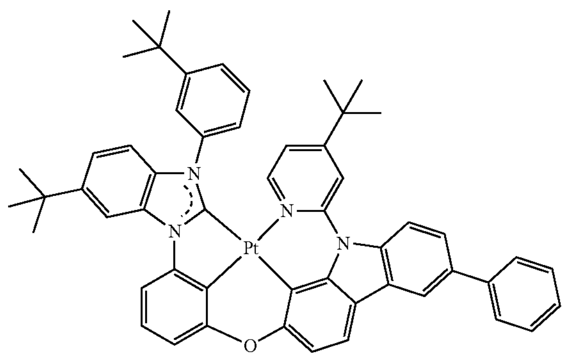
88
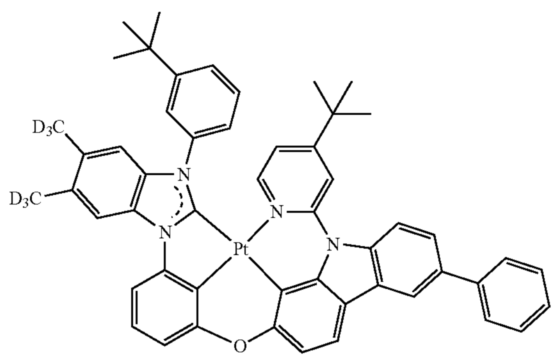
89
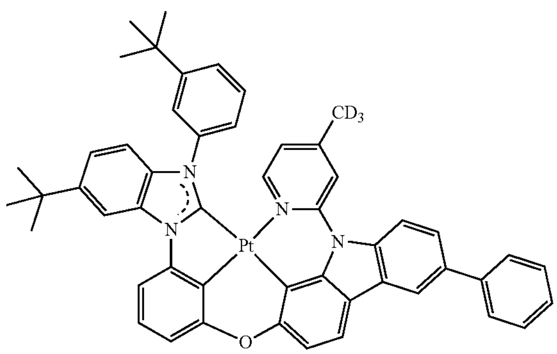
90
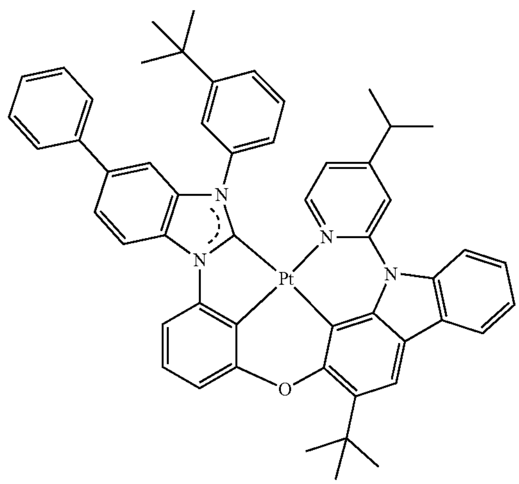
-continued
91
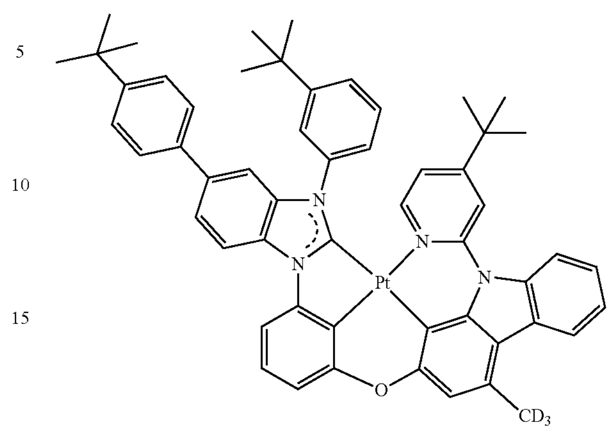
92
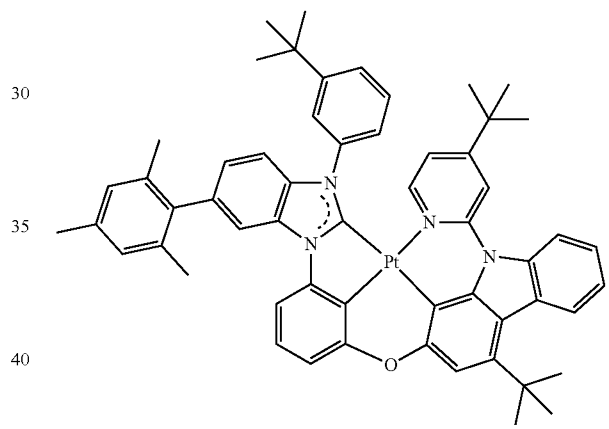
93
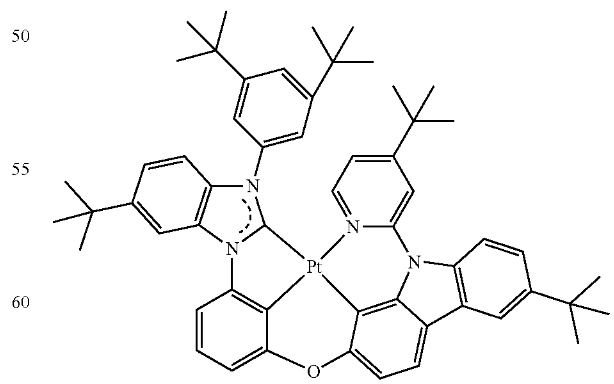

-continued
94
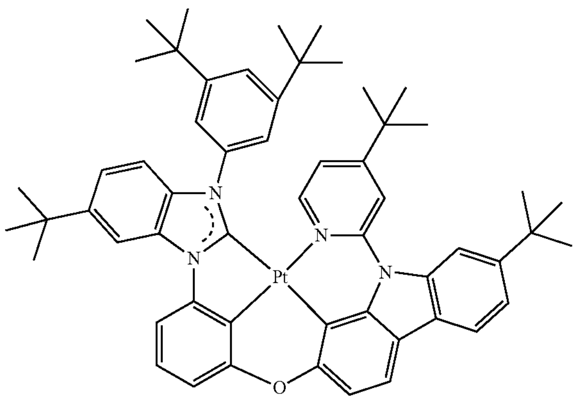
95
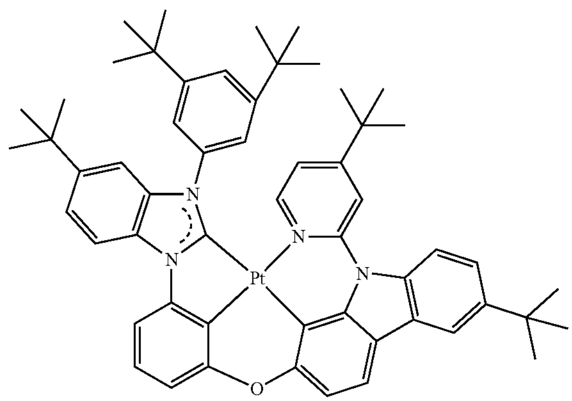
96
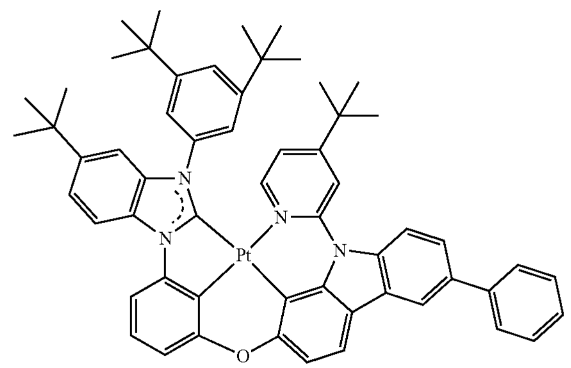
97
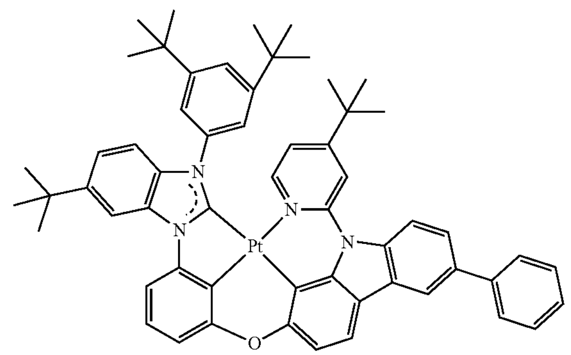
-continued
98
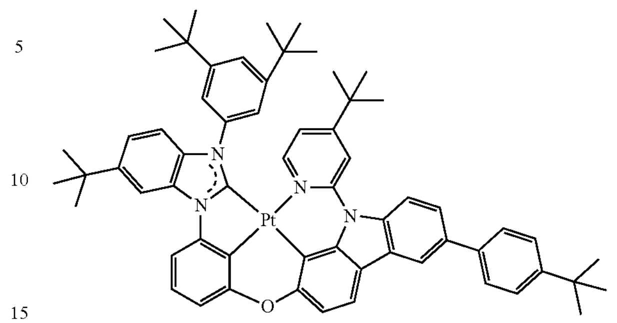
99
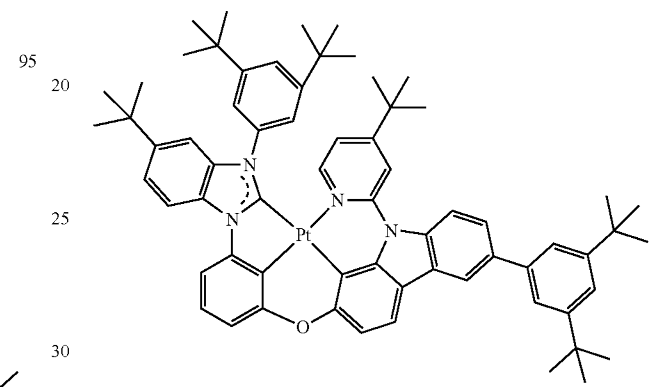
100
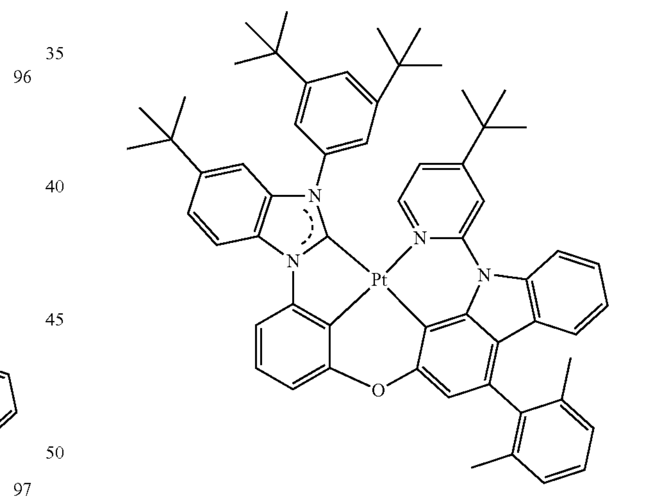
101
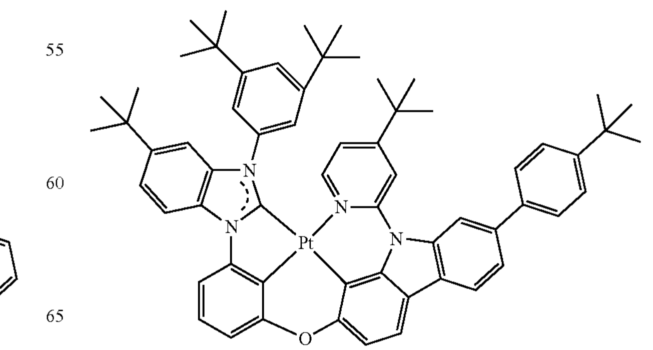

-continued
102
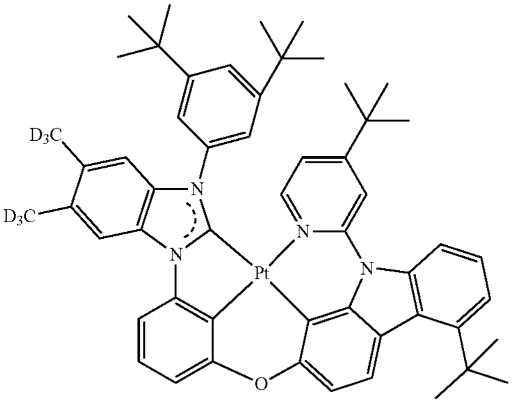
103
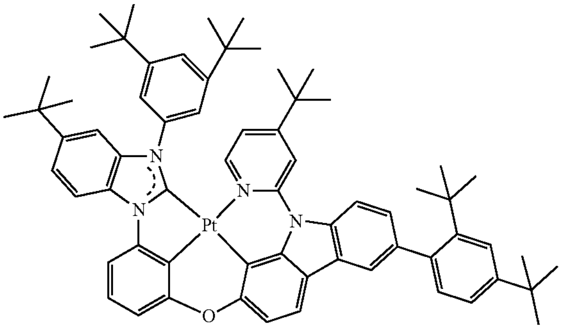
104
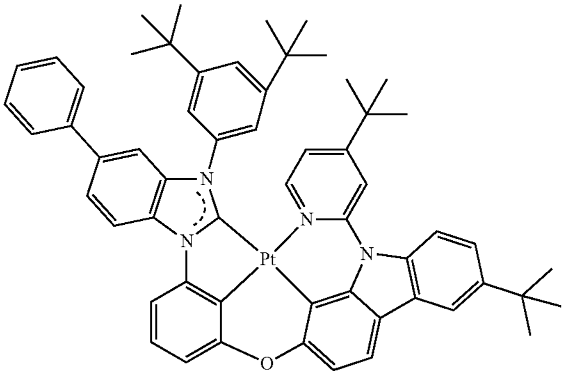
105
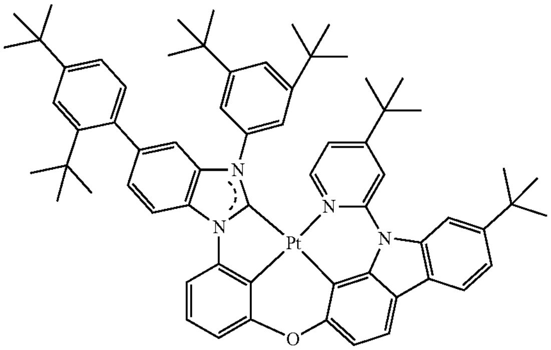
-continued
106
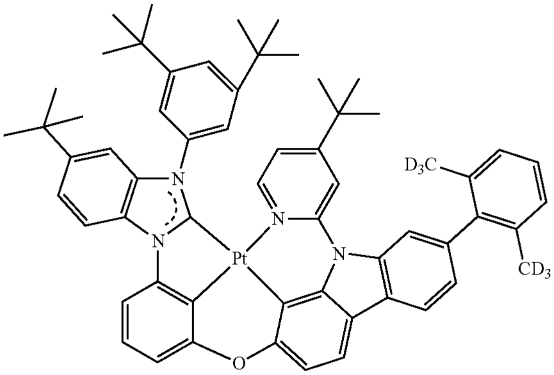
107
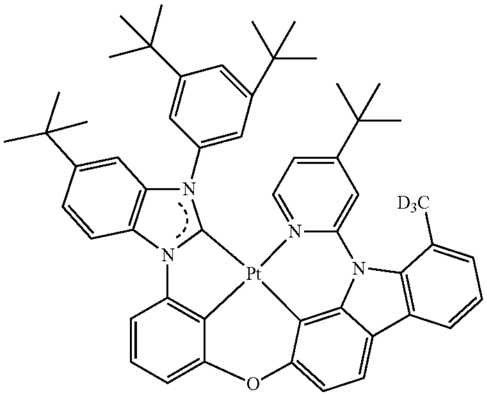
108
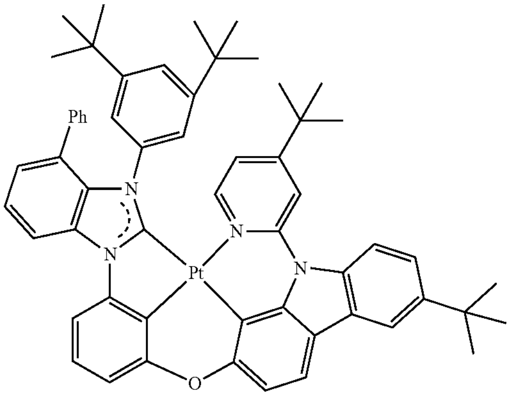
109
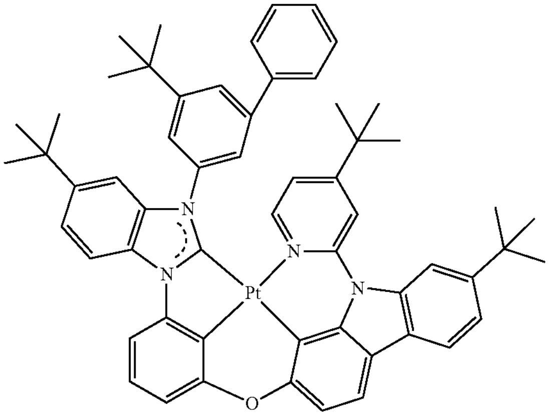

110
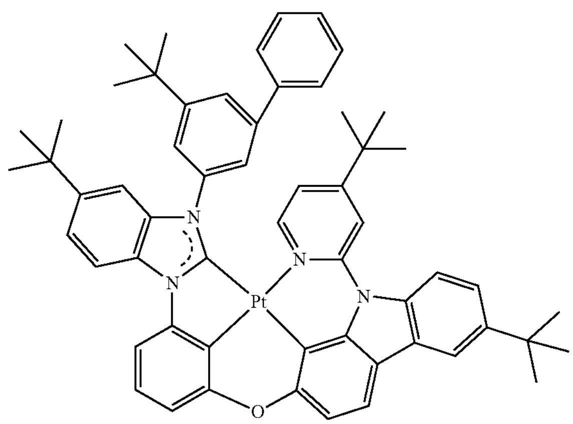
111
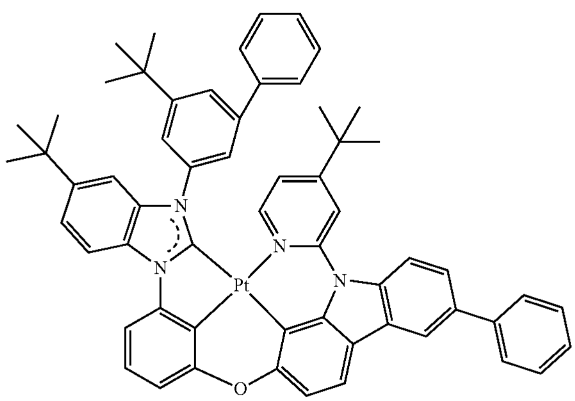
112
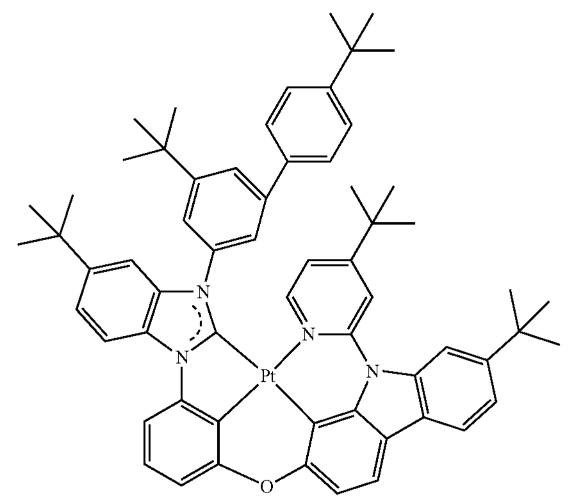
113
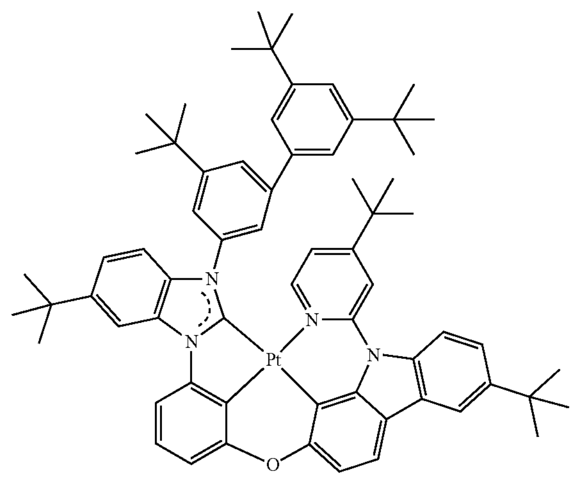
114
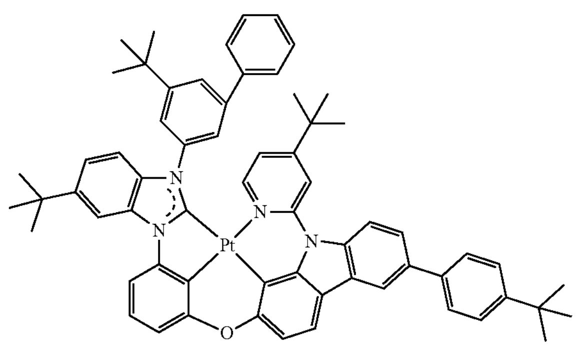
115
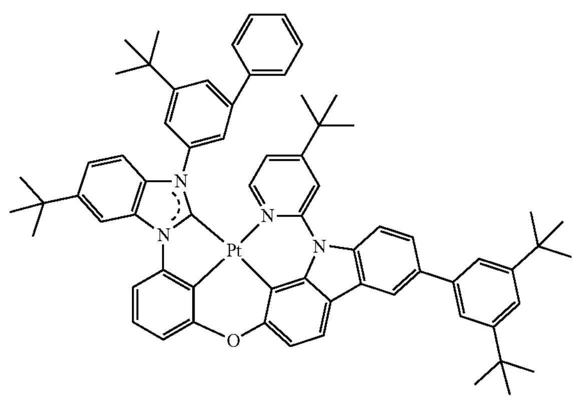

-continued
116
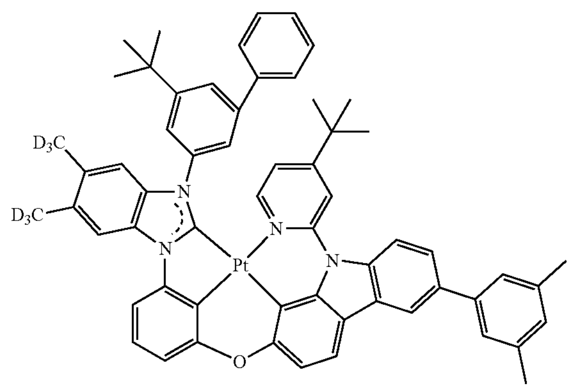
117
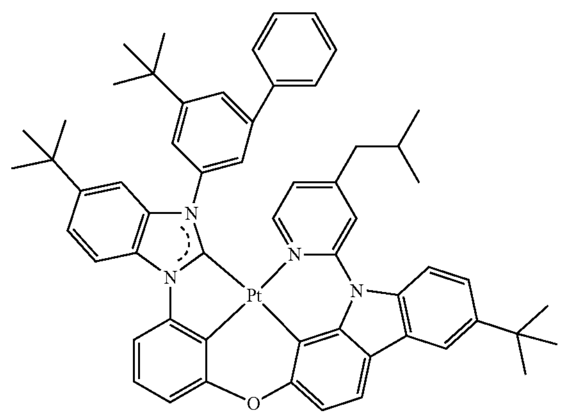
118
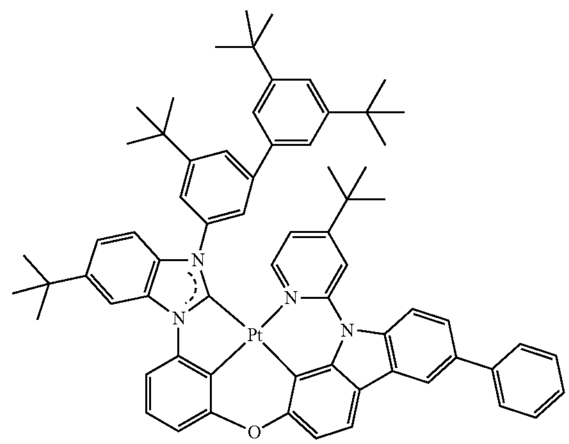
-continued
119
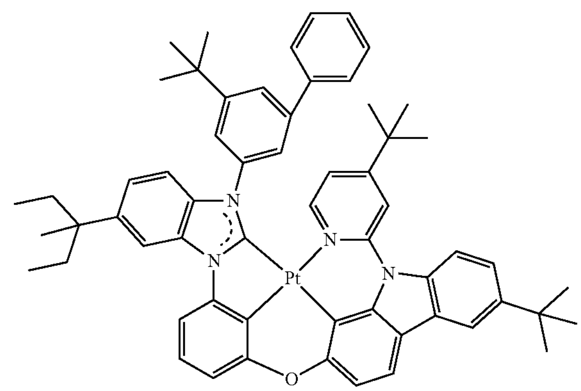
120
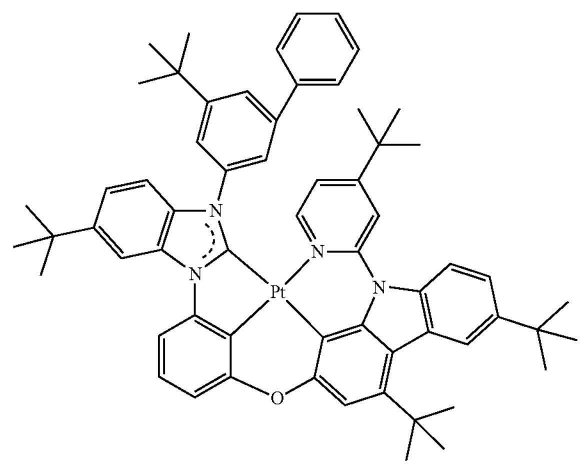
121
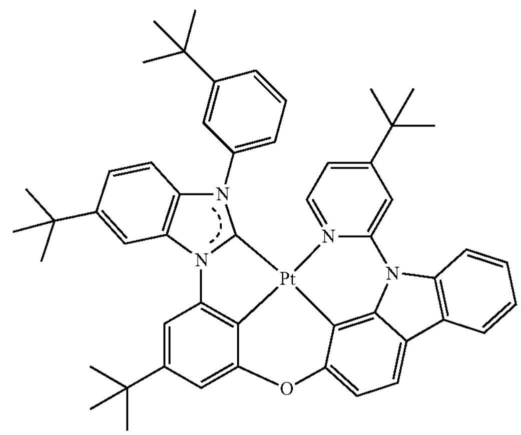

-continued
122
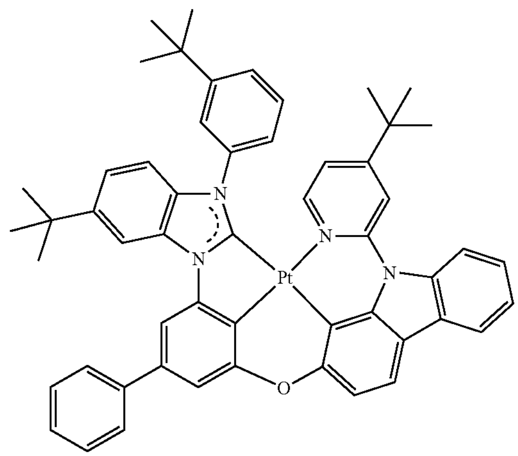
123
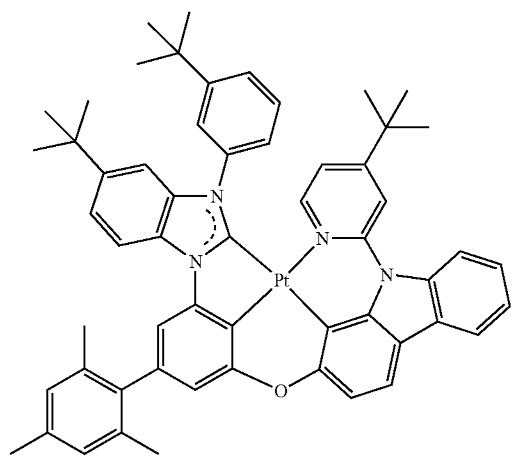
124
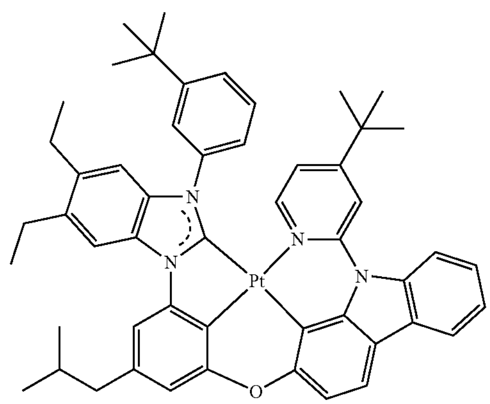
-continued
125
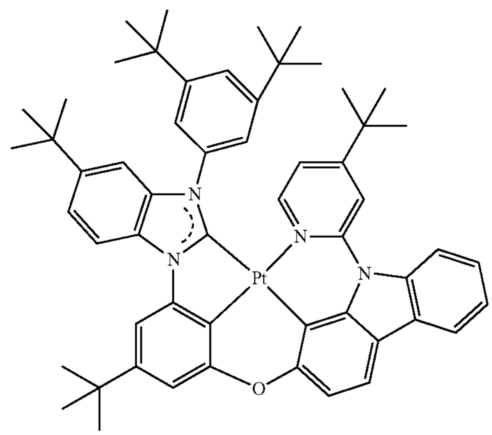
126
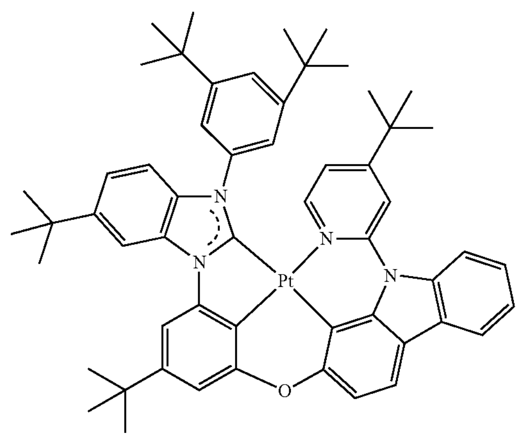
127
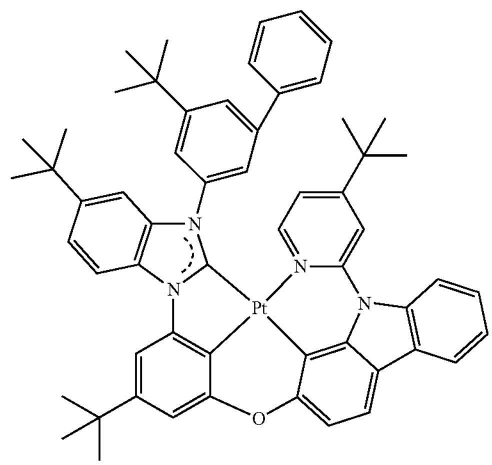

-continued
128
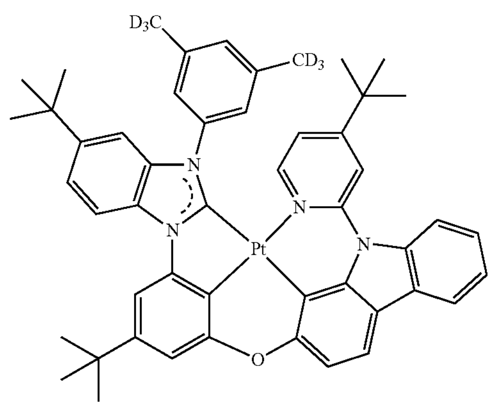
129
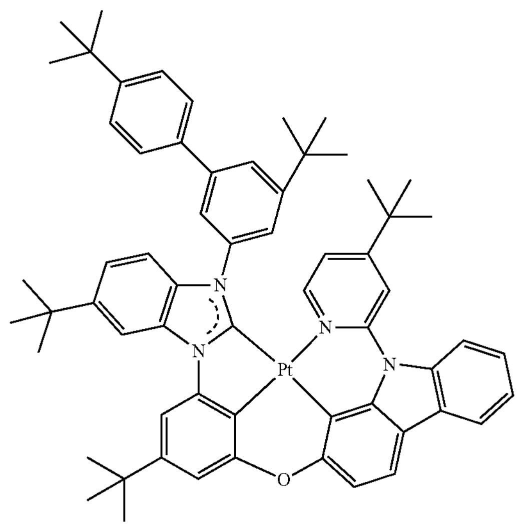
130
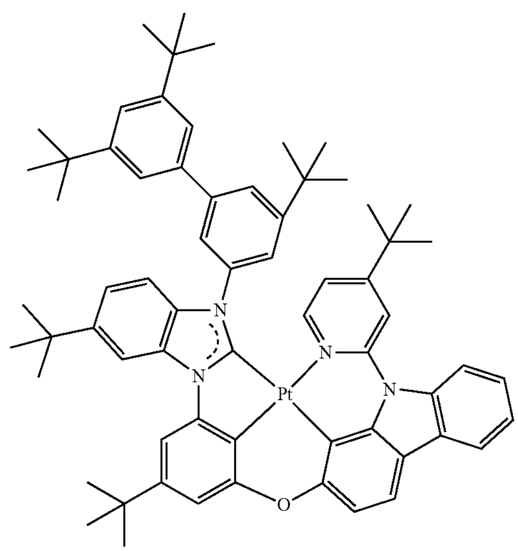
-continued
131
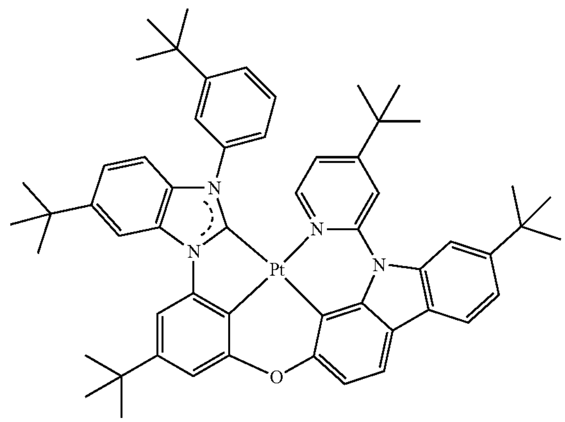
132
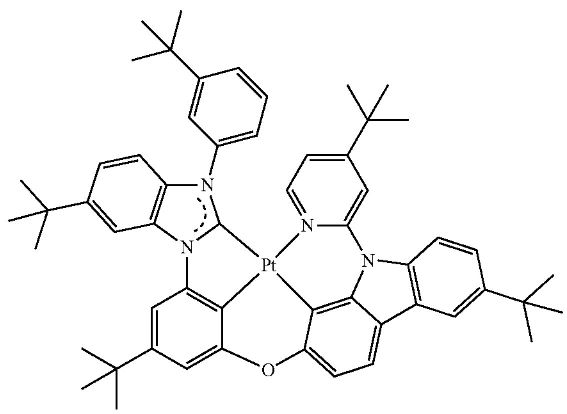
133
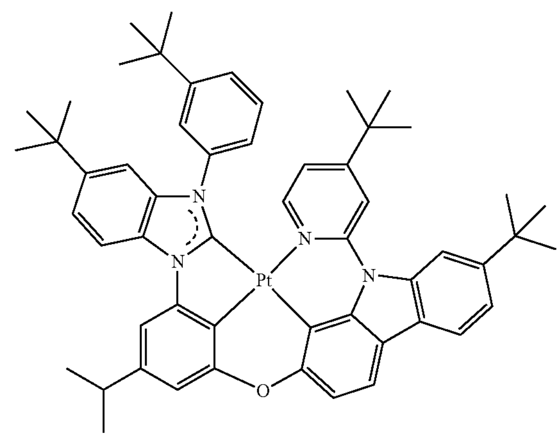

-continued
134
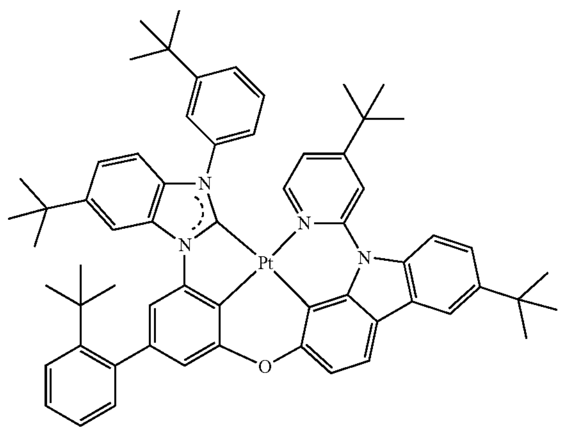
135
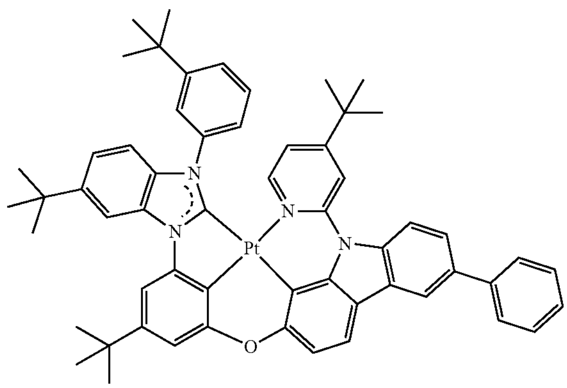
136
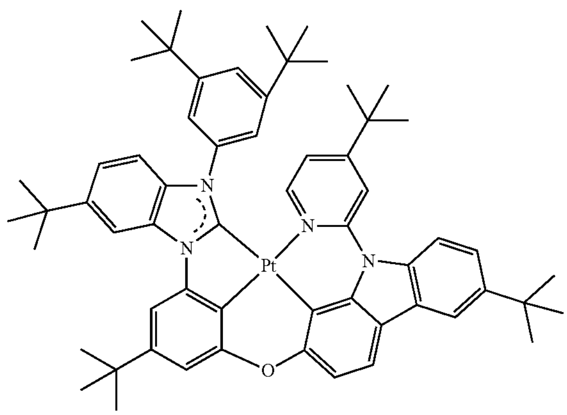
-continued
137
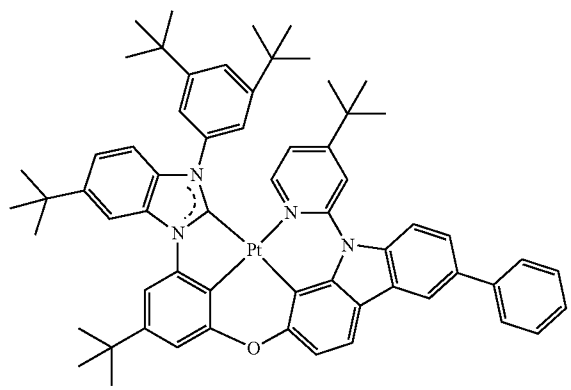
138
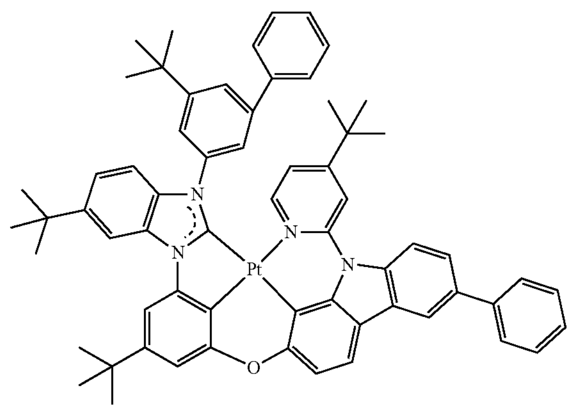
139
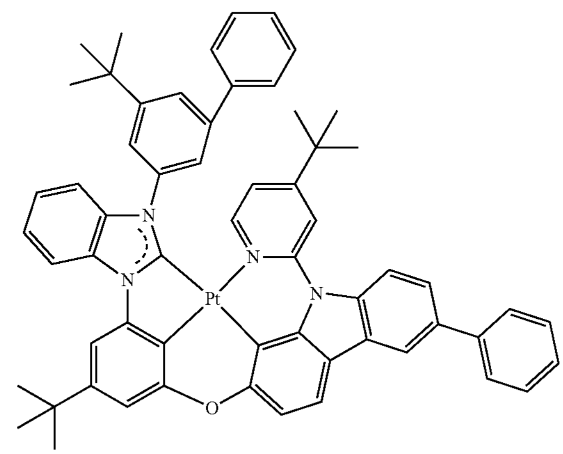

-continued
140
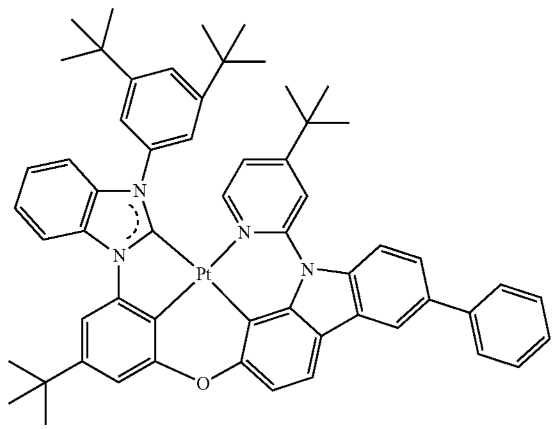
141
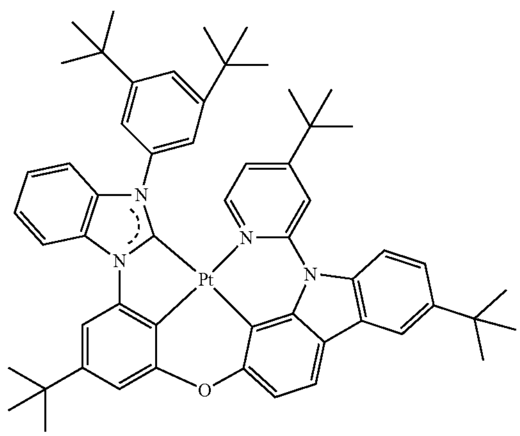
142
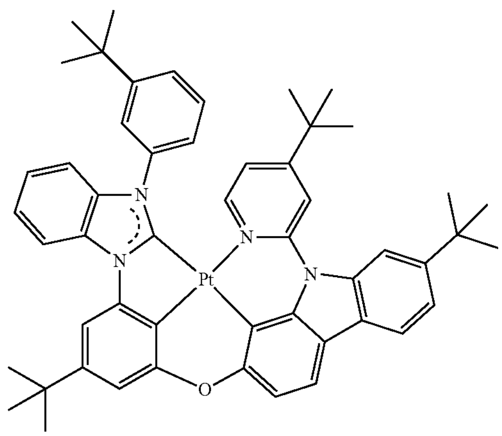
-continued
143
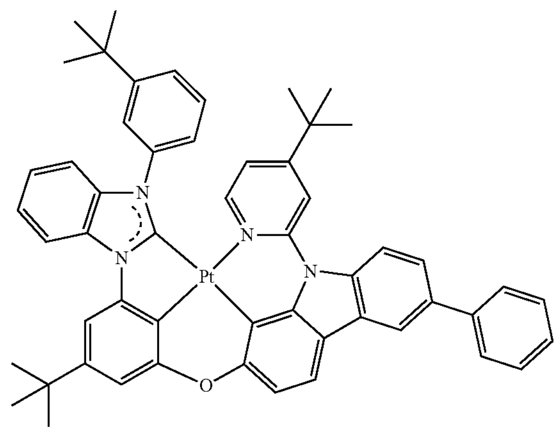
144
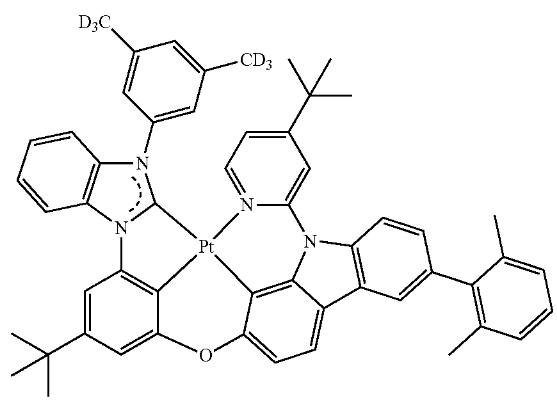
145
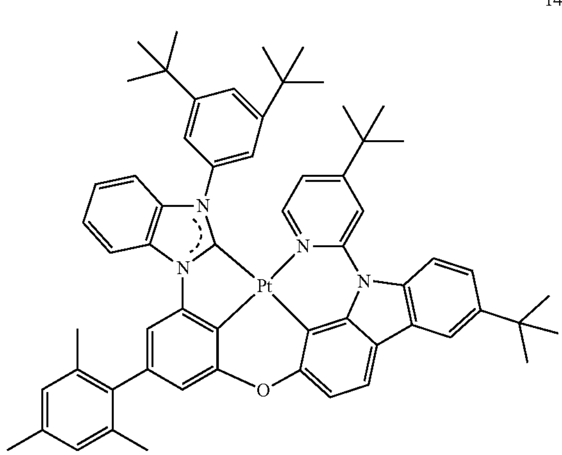

-continued
146
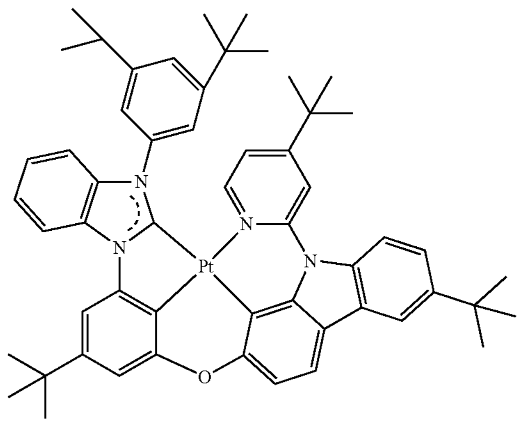
147
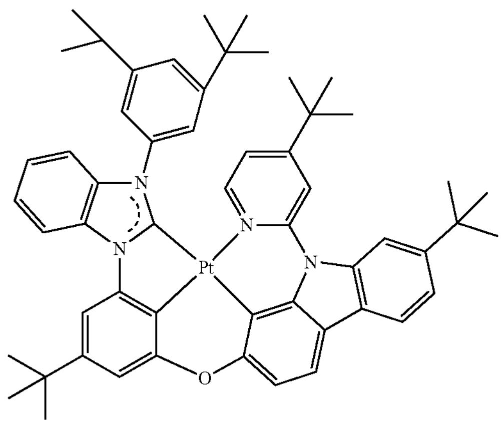
148
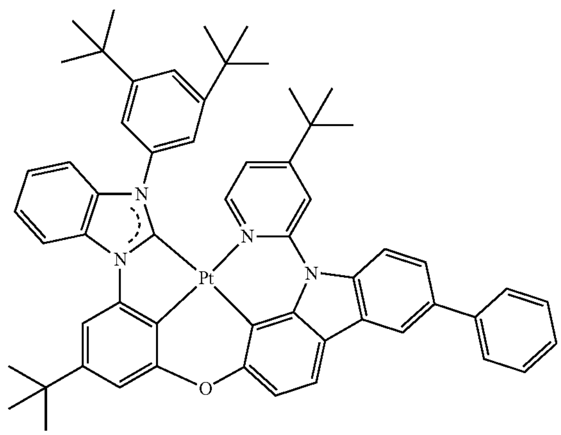
-continued
149
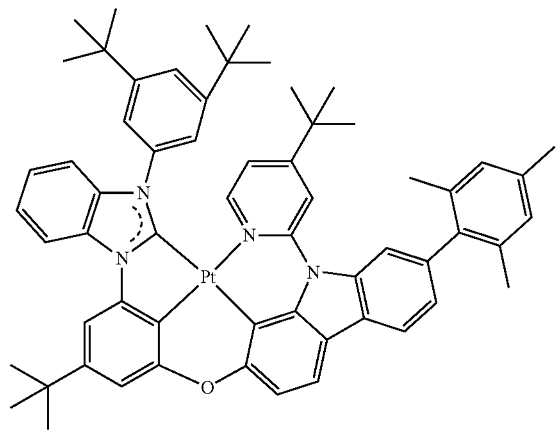
150
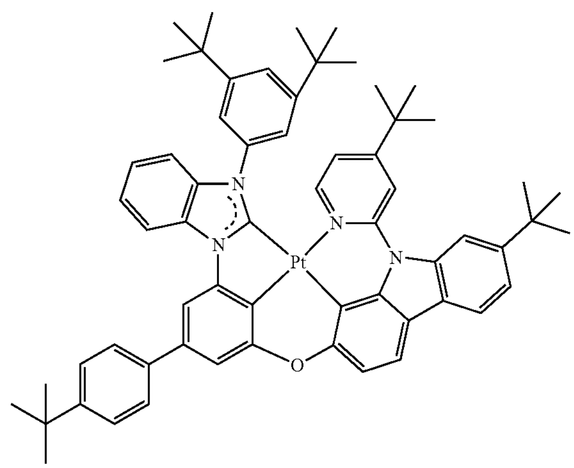
151
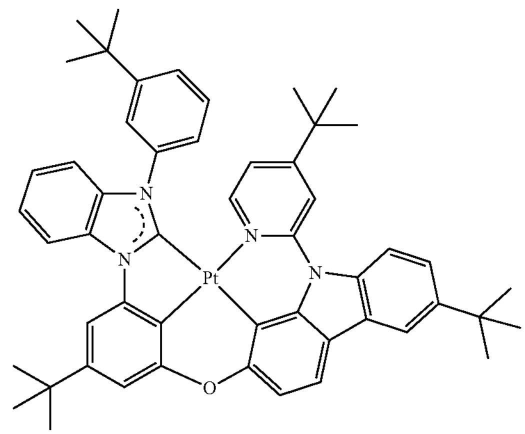

-continued
152
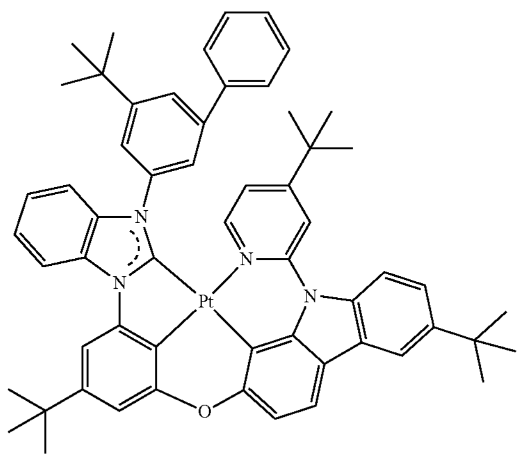
153
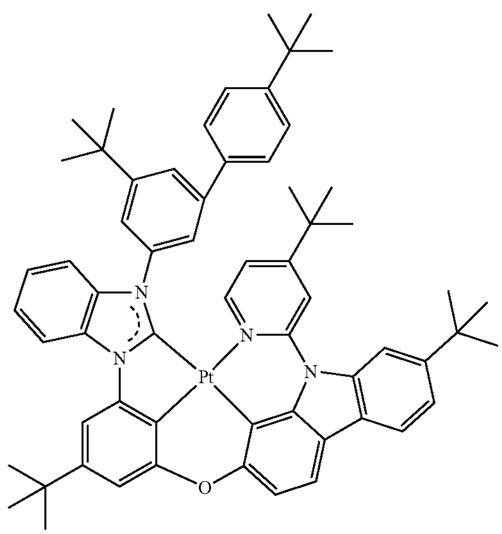
154
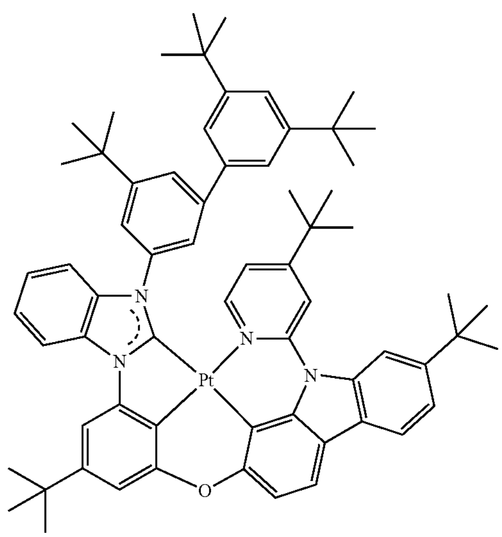
-continued
155
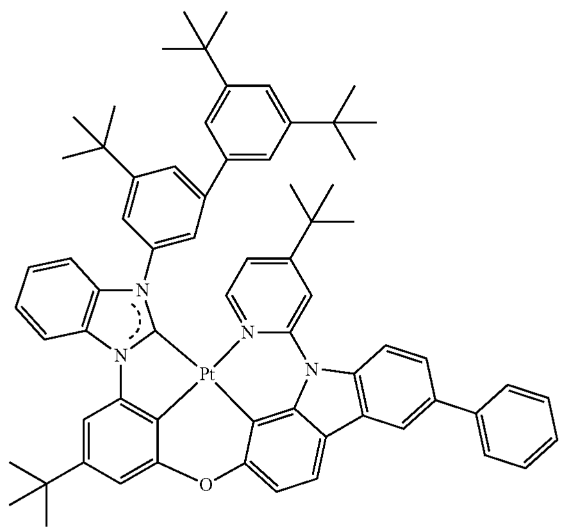
156
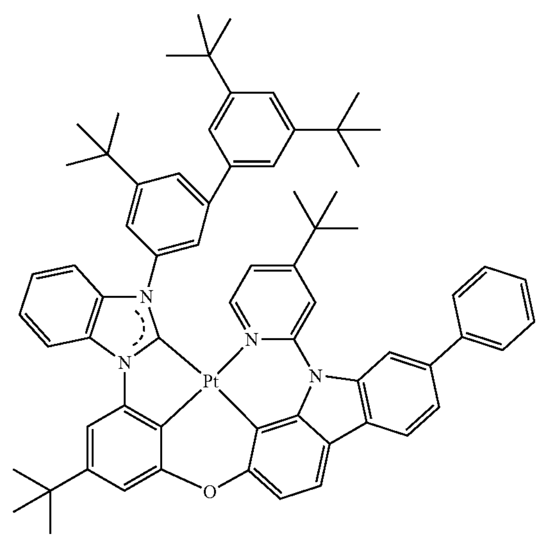
157
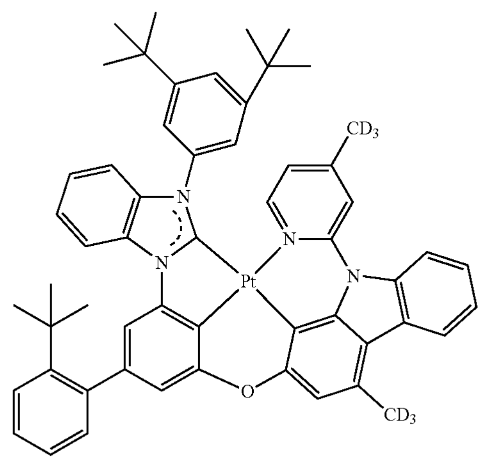

-continued
158
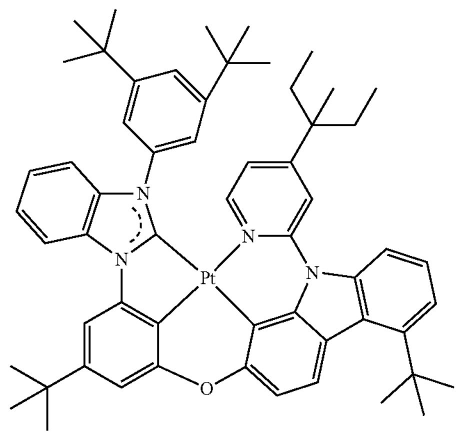
159
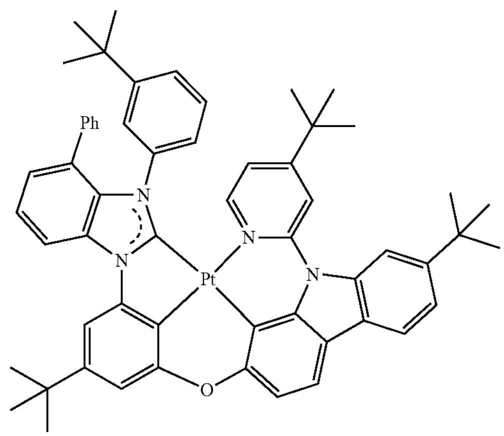
160
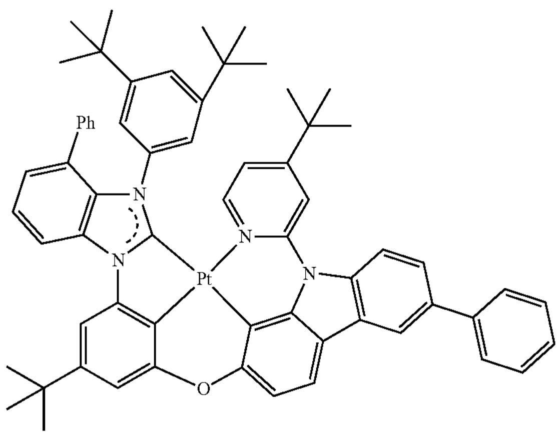
-continued
161
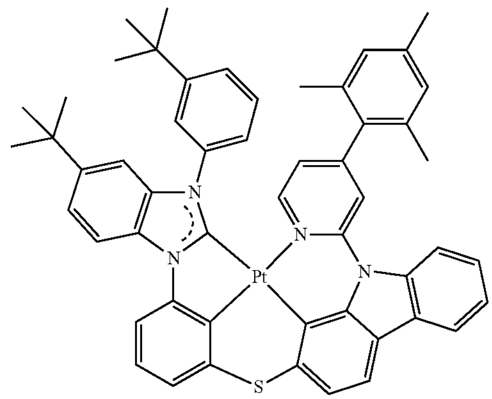
162
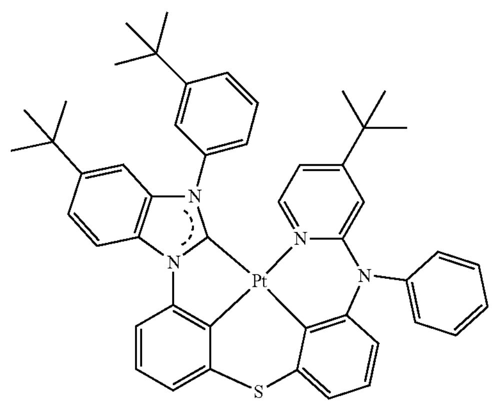
163
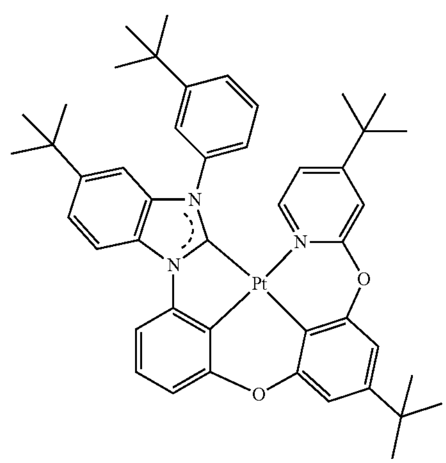

-continued
164
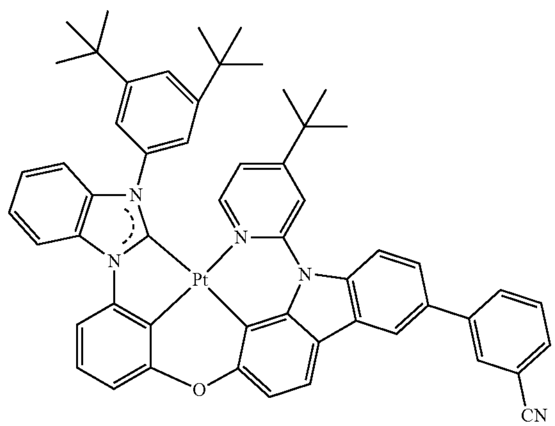
165
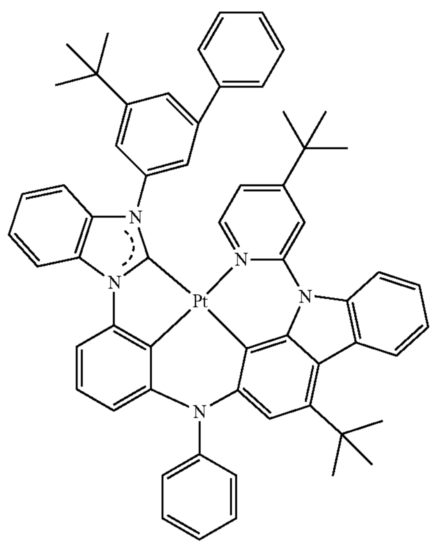
166
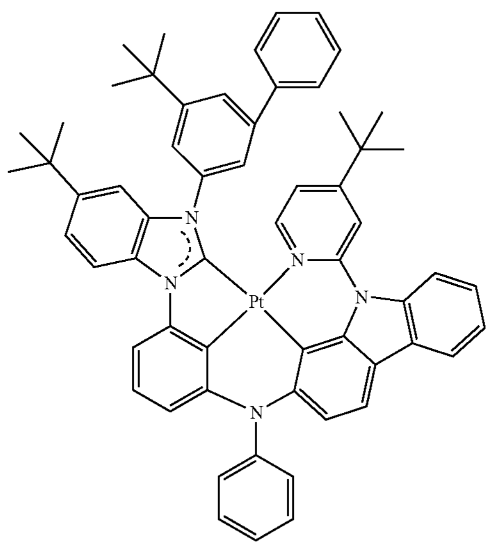
-continued
167
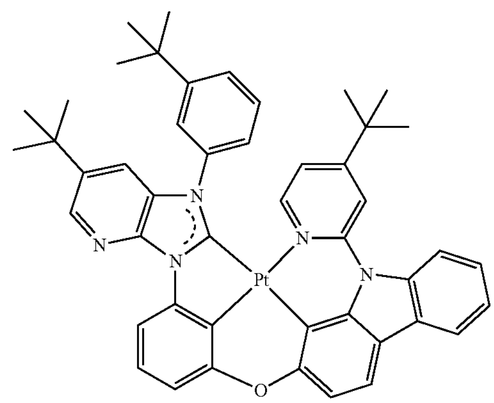
168
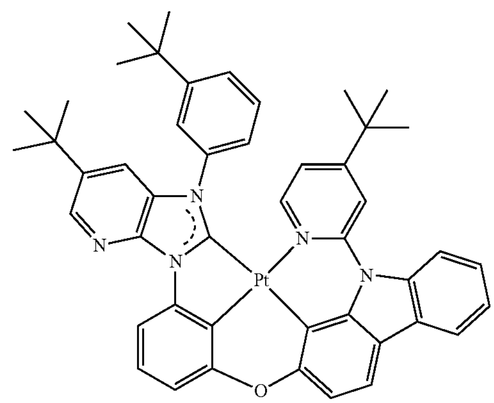
169
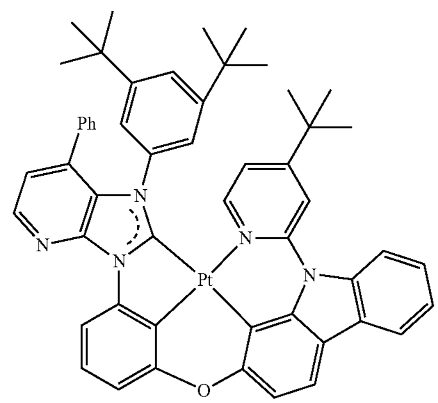
170
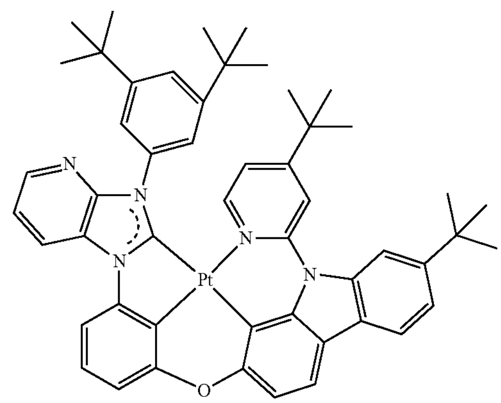

-continued
171
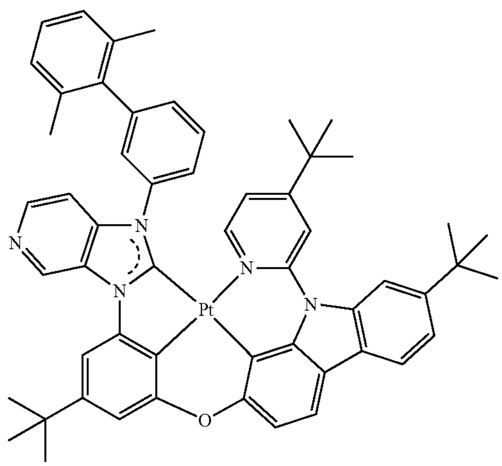
172
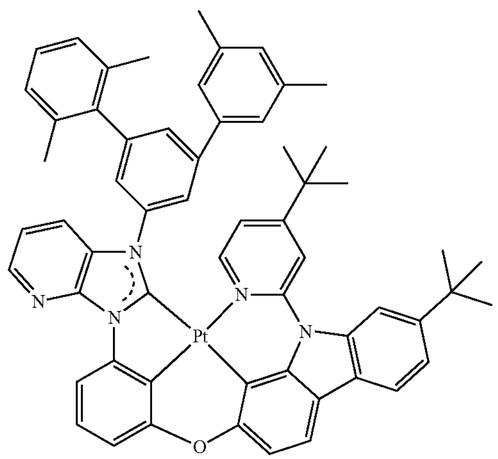
173
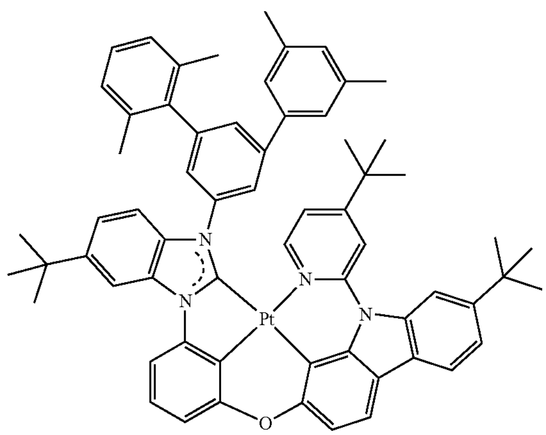
-continued
174
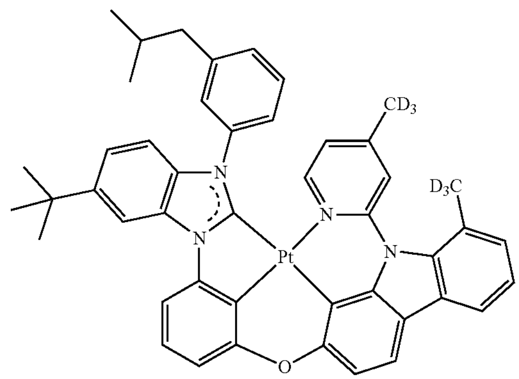
175
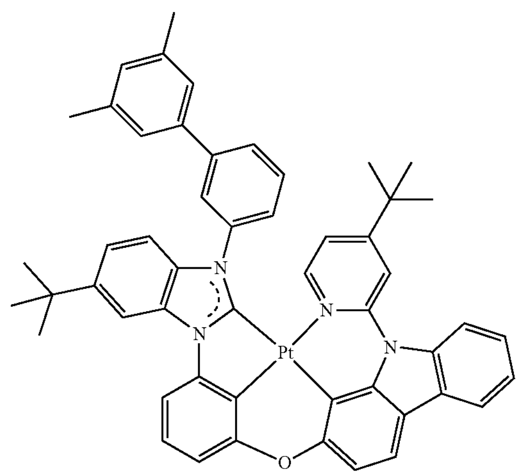
176
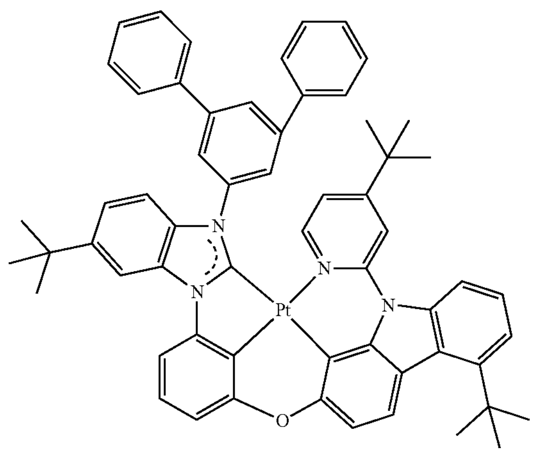
In one or more embodiments, the sensitizer may be represented by Formula 101 or 102, and in this regard, the sensitizer may be referred to as a delayed fluorescence sensitizer:

Formula 101

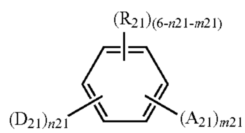

Formula 102

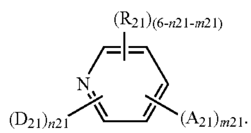

In Formulae 101 and 102, $A_{21}$ may be an acceptor group, $D_{21}$ may be a donor group, m21 may be 1, 2, or 3, and n21 may be 1, 2, or 3, the sum of n21 and m21 in Formula 101 may be 6 or less, and the sum of n21 and m21 in Formula 102 may be 5 or less, $R_{21}$ may be hydrogen, deuterium, —F, —Cl, —Br, —I, $SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ alkylheteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, $Si(Q_1)(Q_2)(Q_3)$, $—Ge(Q_1)(Q_2)(Q_3)$, $—C(Q_1)(Q_2)(Q_3)$, $—B(Q_1)(Q_2)$, $—N(Q_1)(Q_2)$, $—P(Q_1)(Q_2)$, $—C(=O)(Q_1)$, $—S(=O)(Q_1)$, $—S(=O)_2(Q_1)$, $—P(=O)(Q_1)(Q_2)$, or $—P(=S)(Q_1)(Q_2)$, wherein a plurality of $R_{21}$ may optionally be linked together to form a substituted or unsubstituted $C_5$-$C_{30}$ carbocyclic group or a substituted or unsubstituted $C_1$-$C_{30}$ heterocyclic group, and $Q_1$ to $Q_3$ may each independently be hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent aromatic condensed polycyclic group, a monovalent aromatic condensed heteropolycyclic group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof.

For example, in Formulae 101 and 102, $A_{21}$ may be a substituted or unsubstituted π electron-depleted nitrogen-free cyclic group.

In an embodiment, the π electron-depleted nitrogen-free cyclic group may be: a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a triindolobenzene group; or a condensed cyclic group of two or more π electron-depleted nitrogen-free cyclic groups, but embodiments of the present disclosure are not limited thereto.

In an embodiment, in Formulae 101 and 102, $D_{21}$ may be:

—F, a cyano group, or a π electron-depleted nitrogen-containing cyclic group;

a $C_1$-$C_{60}$ alkyl group, a π electron-depleted nitrogen-containing cyclic group, or a π electron-depleted nitrogen-free cyclic group, each substituted with at least one —F, a cyano group, or a combination thereof; or a π-electron depleted nitrogen-containing cyclic group substituted with at least one deuterium, a $C_1$-$C_{60}$ alkyl group, a π electron depleted nitrogen-containing cyclic group, a π electron-depleted nitrogen-free cyclic group, or a combination thereof.

In detail, the π electron-depleted nitrogen-free cyclic group may be the same as described herein.

The term "π electron-depleted nitrogen-containing cyclic group" as used herein refers to a cyclic group having at least one *—N=*' moiety, and for example, may be: an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, or a benzimidazolobenzimidazole group; or a condensed cyclic group in which two or more π electron-efficient nitrogen-containing cyclic groups are condensed with each other.

In one or more embodiments, the sensitizer may be compounds of Groups XI to XV, but embodiments of the present disclosure are not limited thereto:
Group XI
1
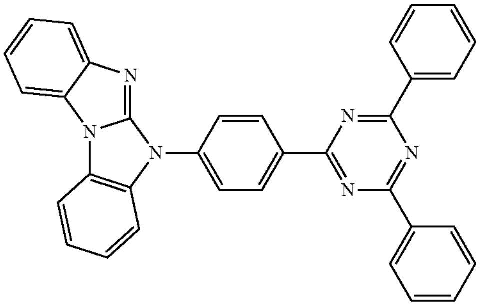
2
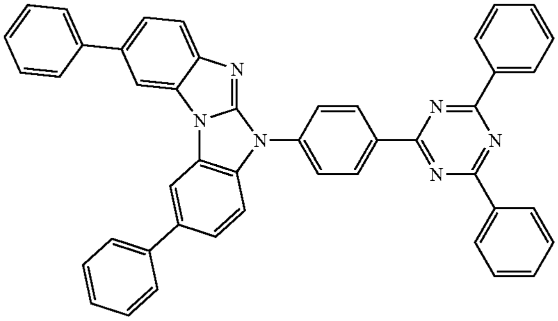
3
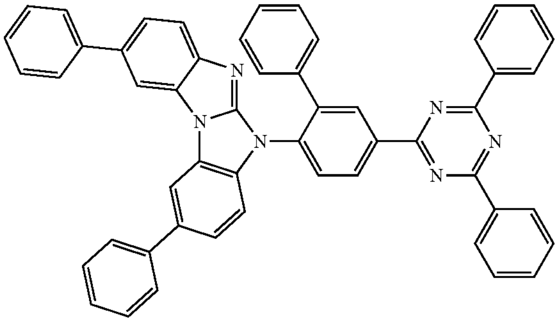
4
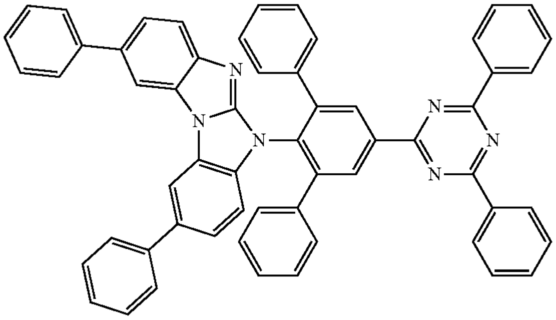
-continued
5
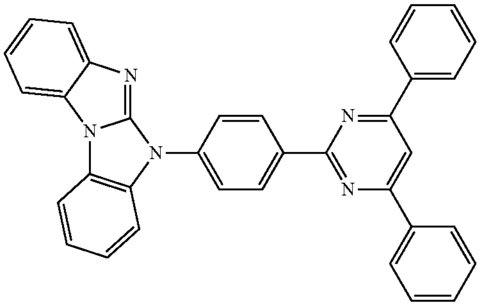
6
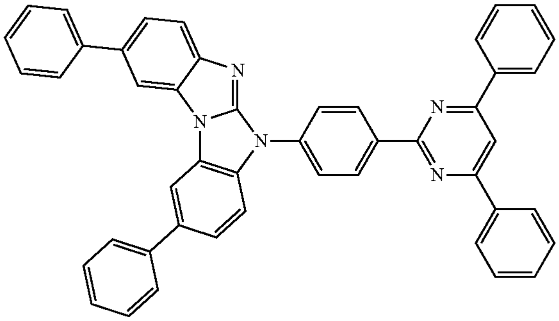
7
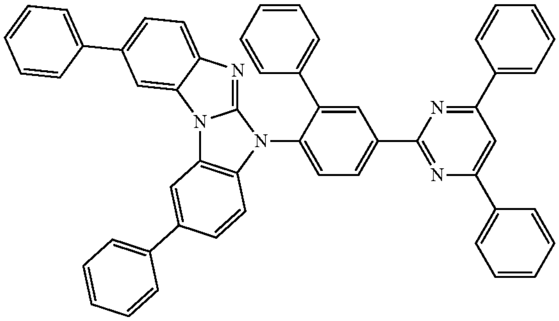
8
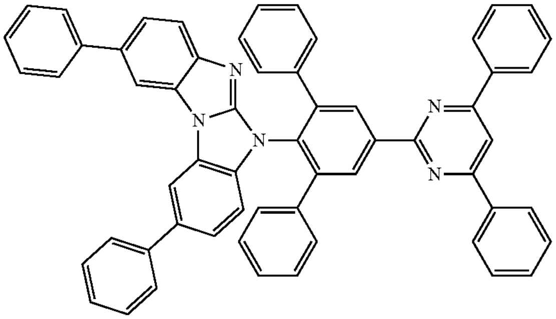

-continued
9
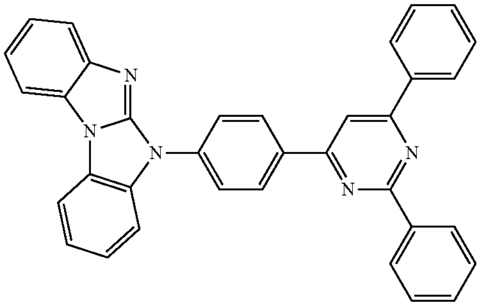
10
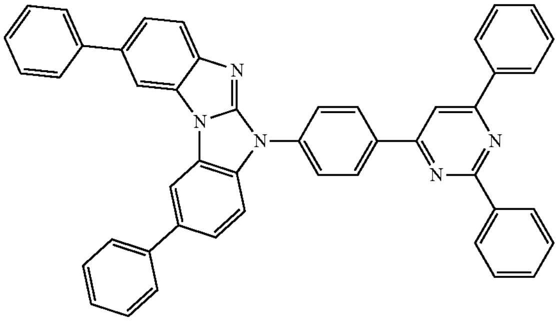
11
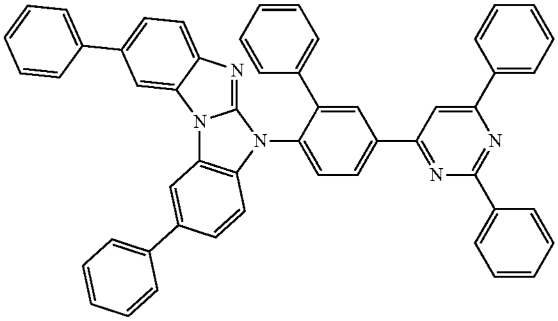
12
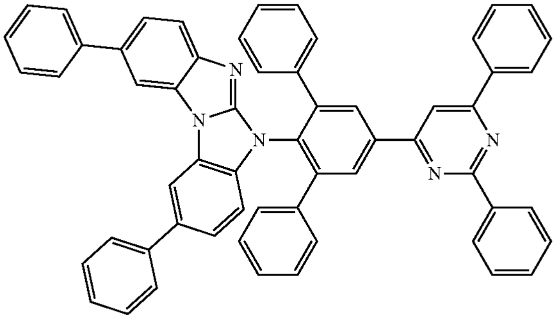
-continued
13
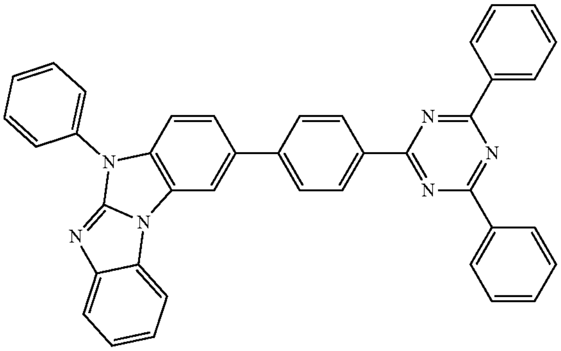
14
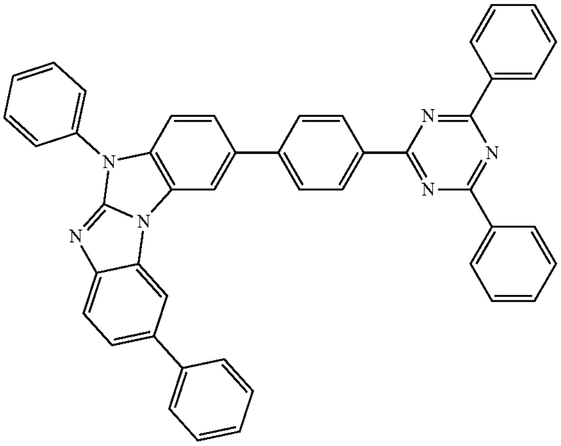
15
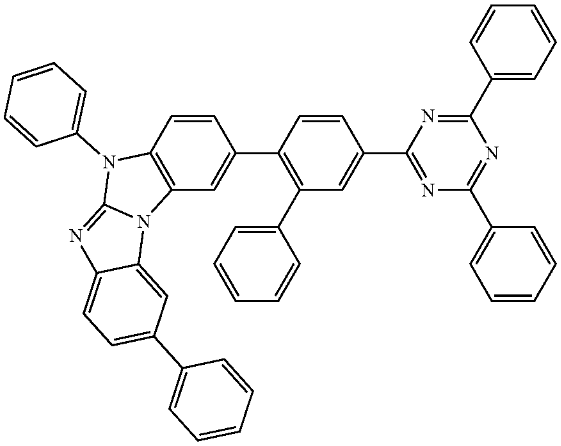

-continued
16
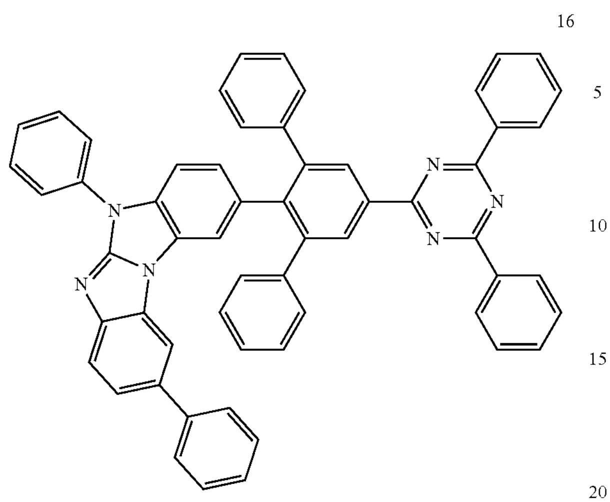
17
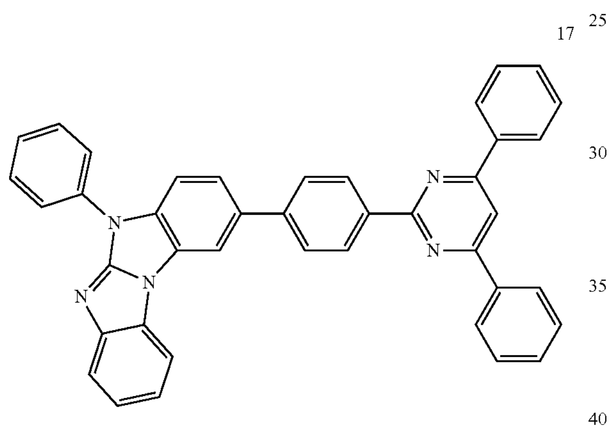
18
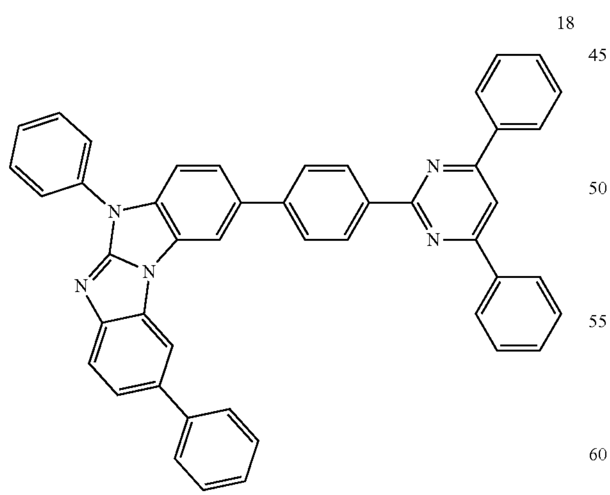
-continued
19
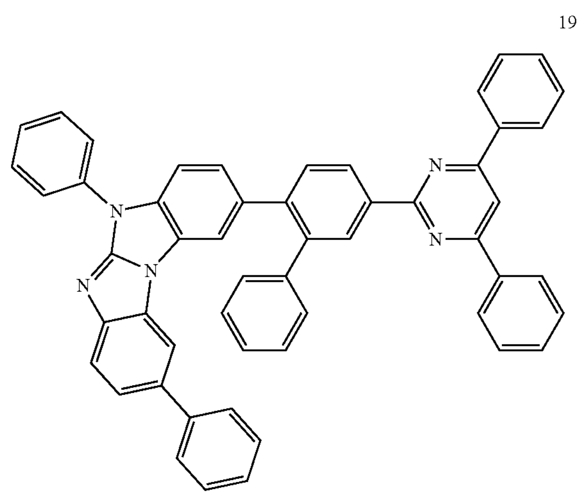
20
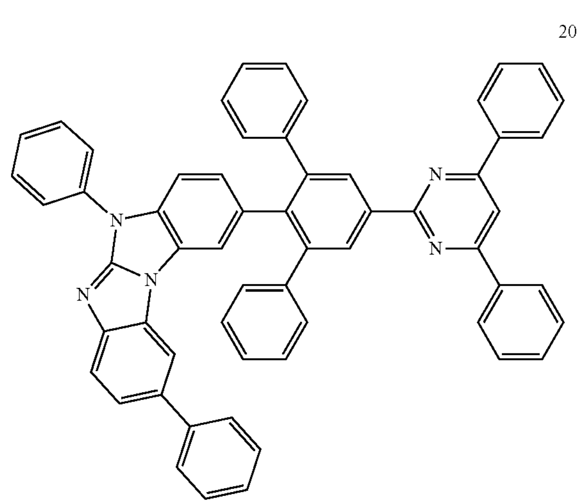
21
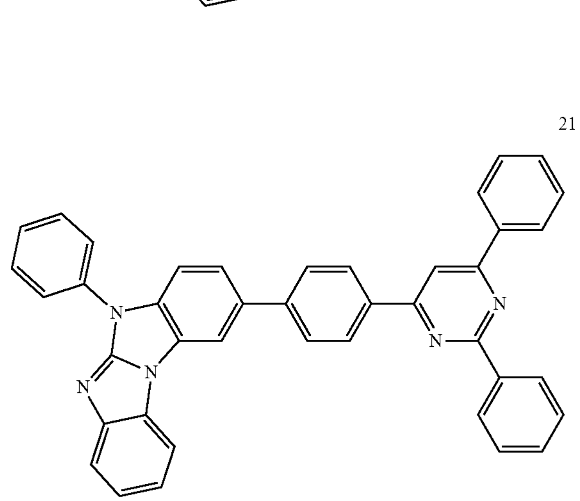

-continued
22
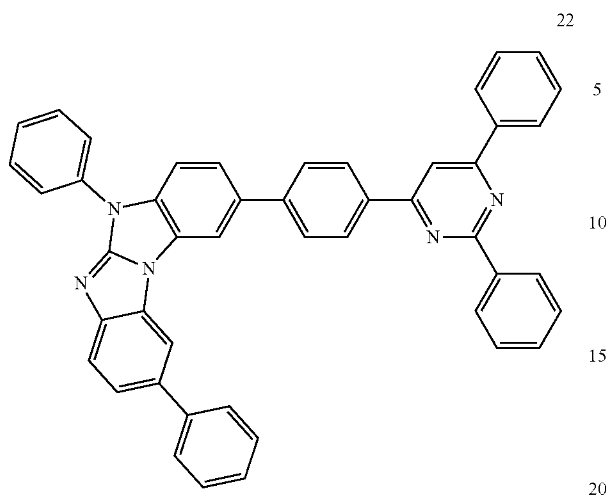
23
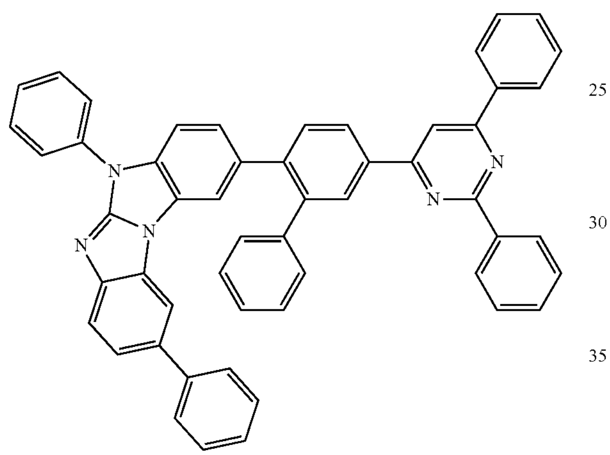
24
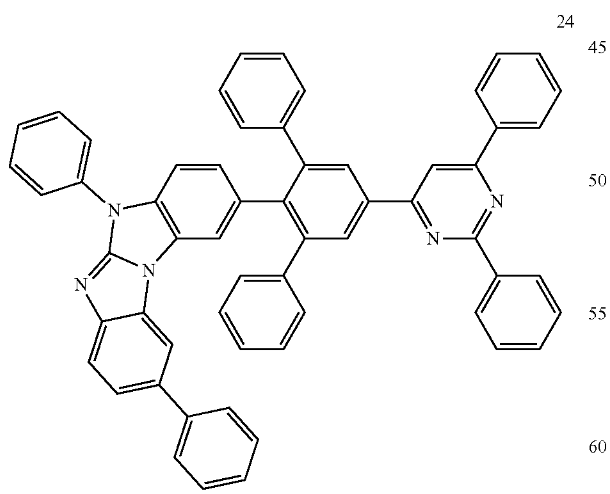
-continued
25
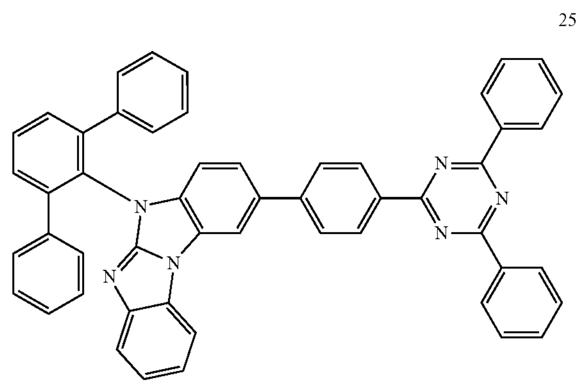
26
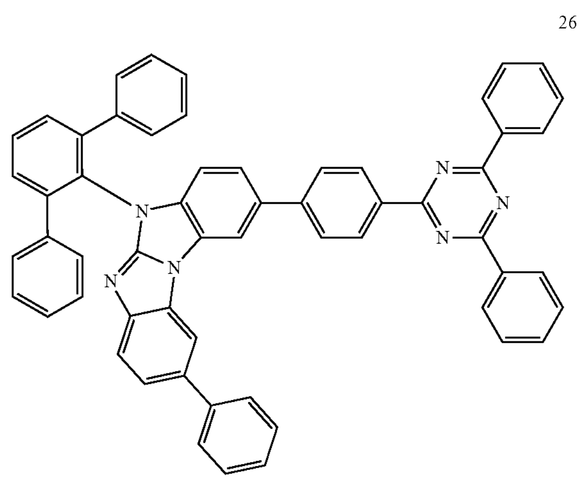
27
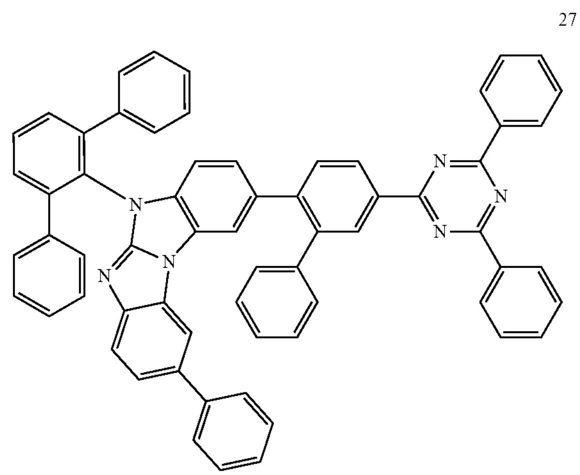

-continued
28
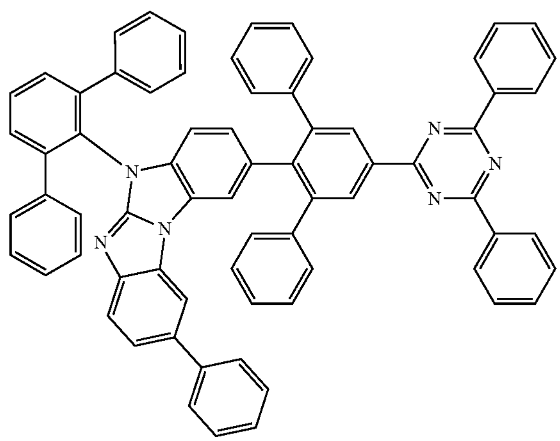
29
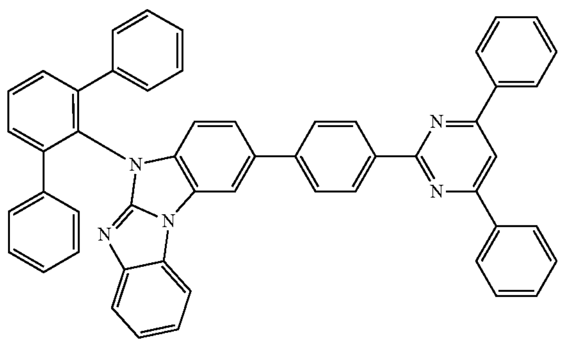
30
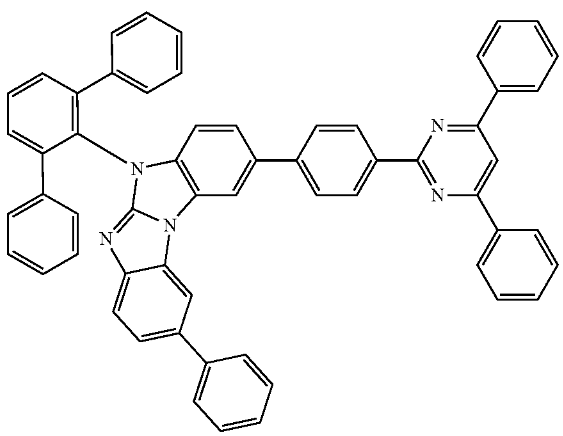
-continued
31
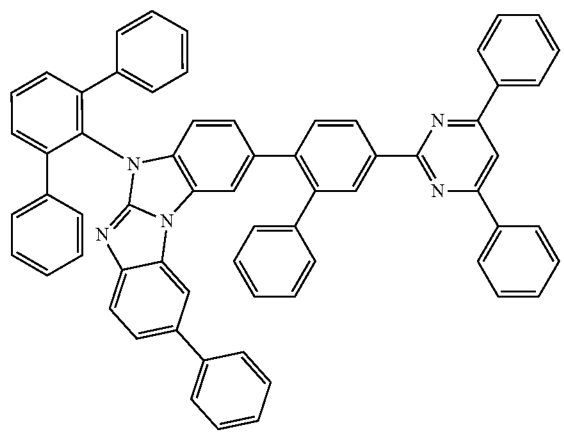
32
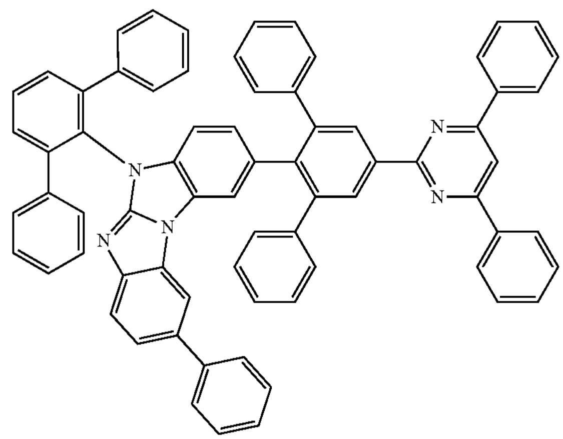
33
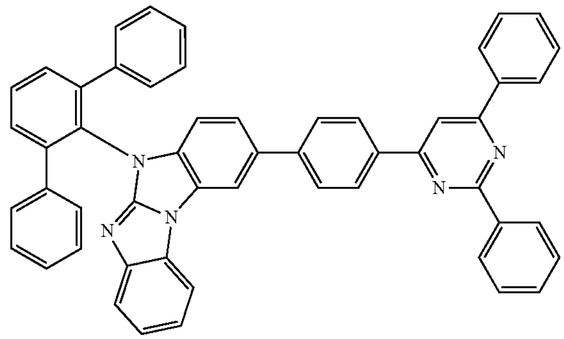

-continued
34
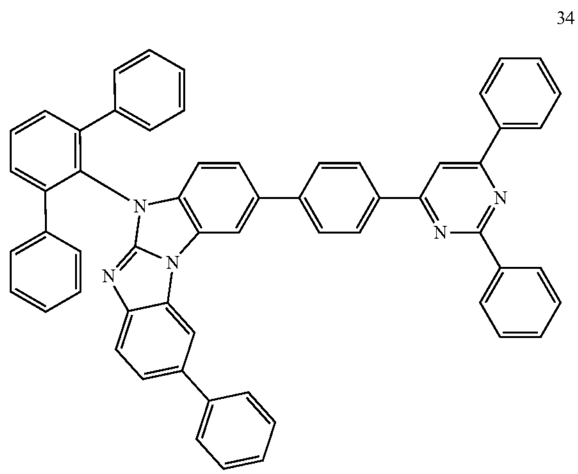
35
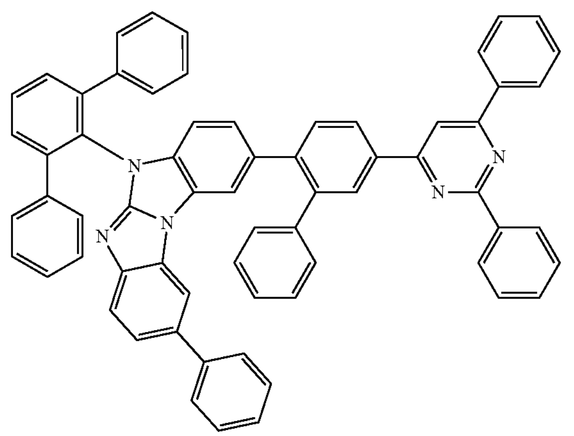
36
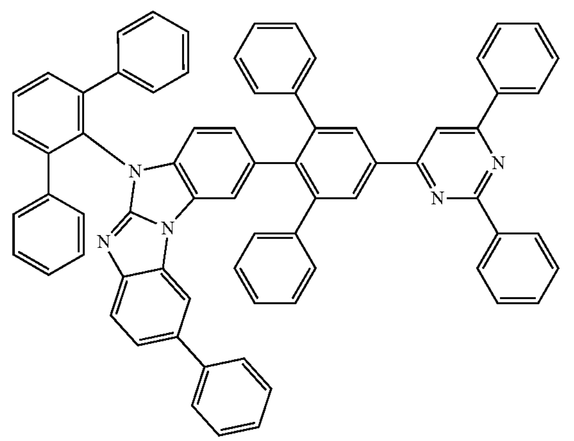
-continued
37
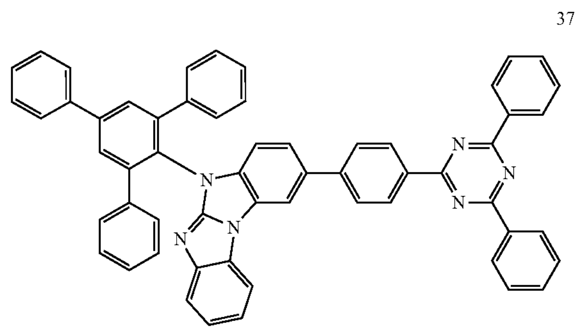
38
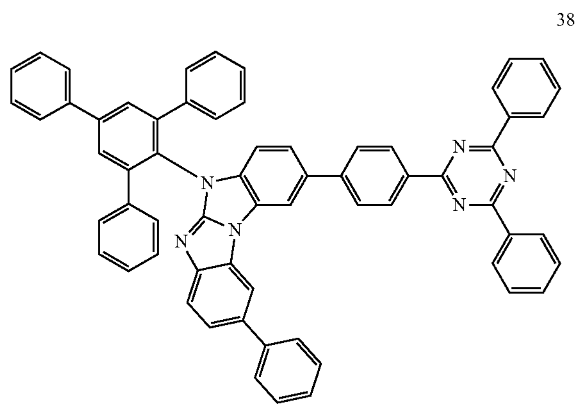
39
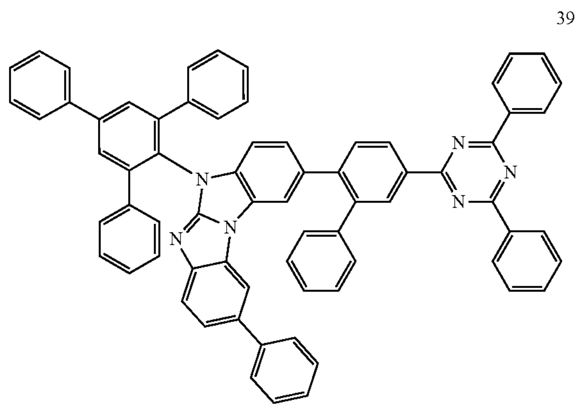
40
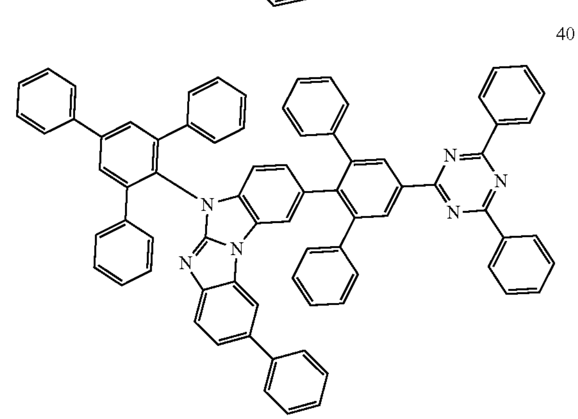

-continued
41
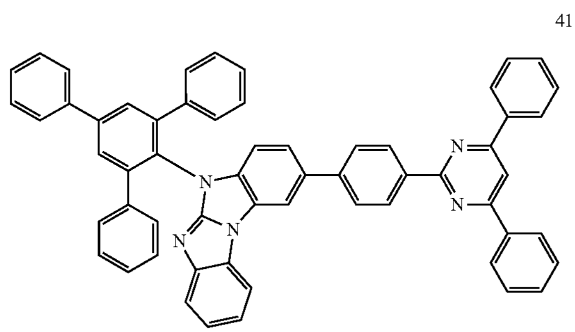
42
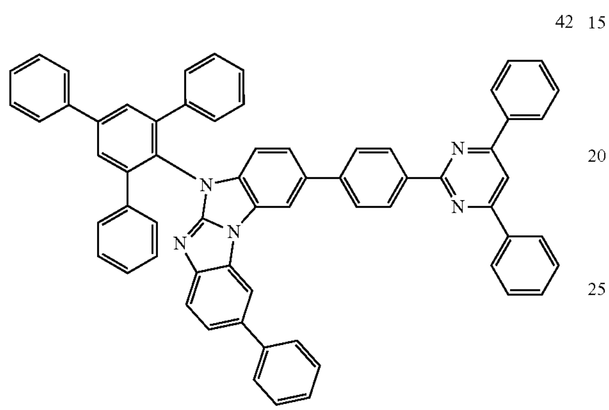
43
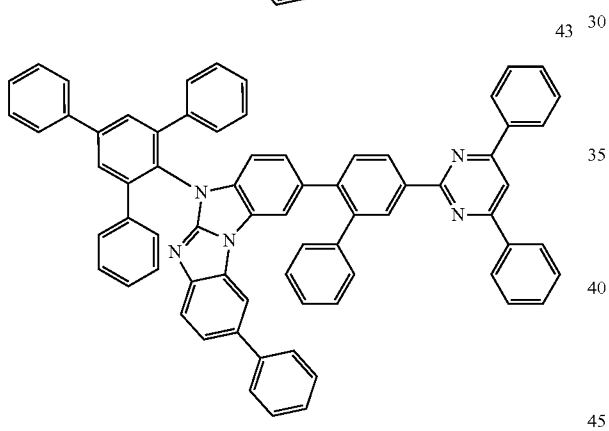
44
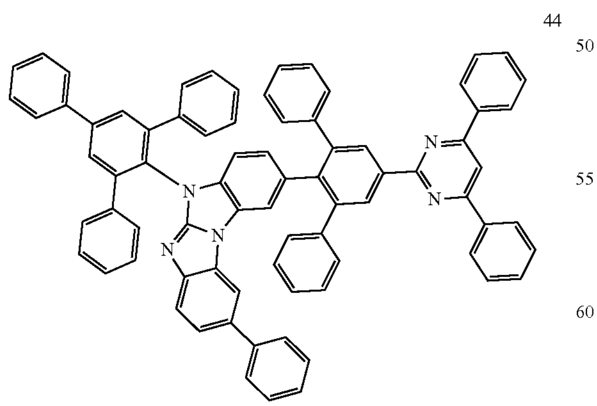
-continued
45
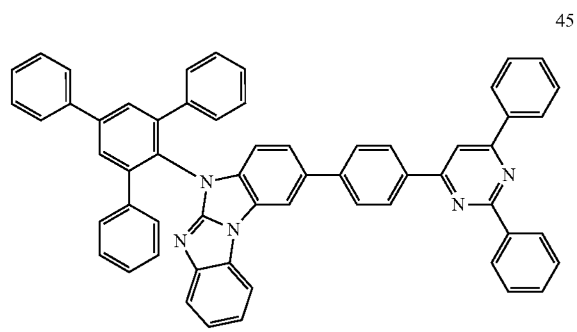
46
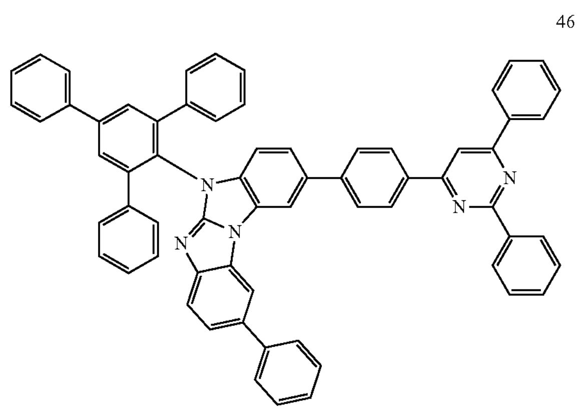
47
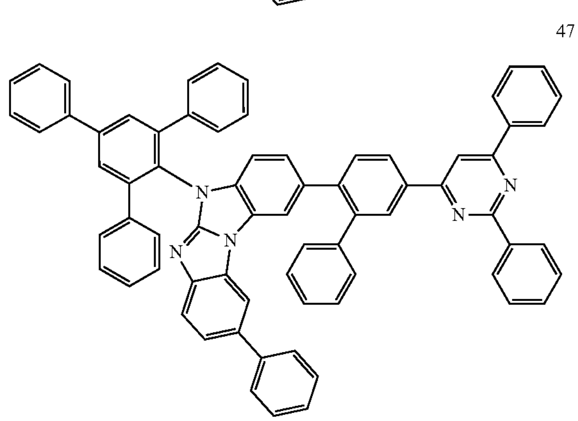
48
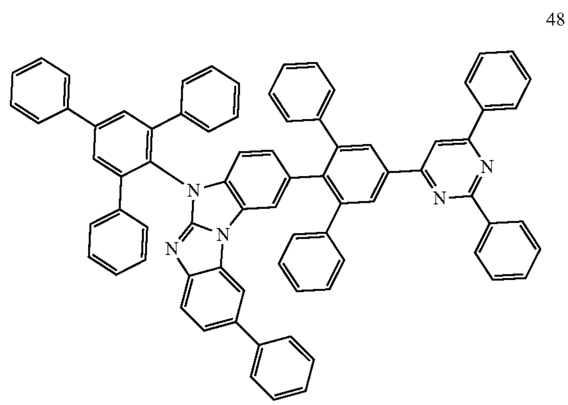

-continued
49
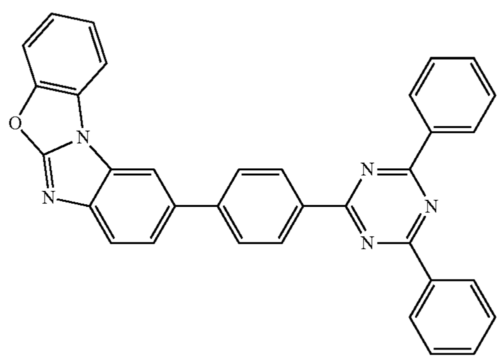
50
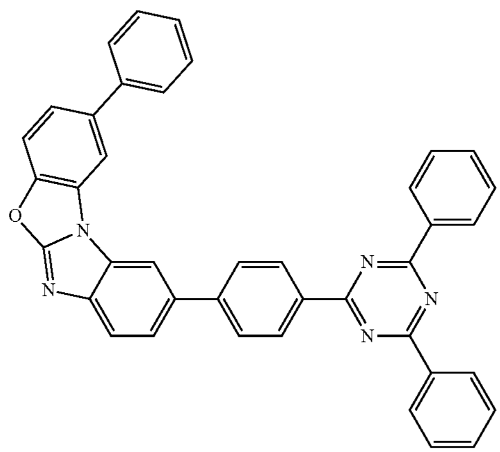
51
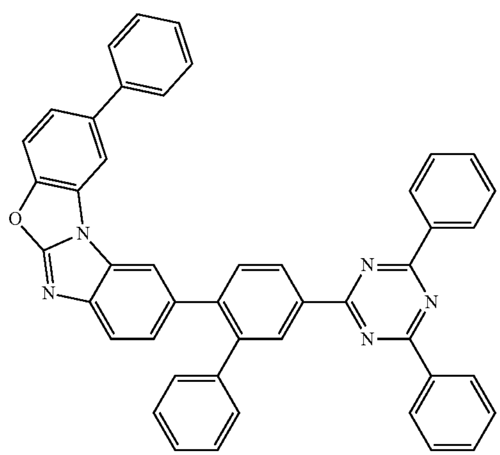
-continued
52
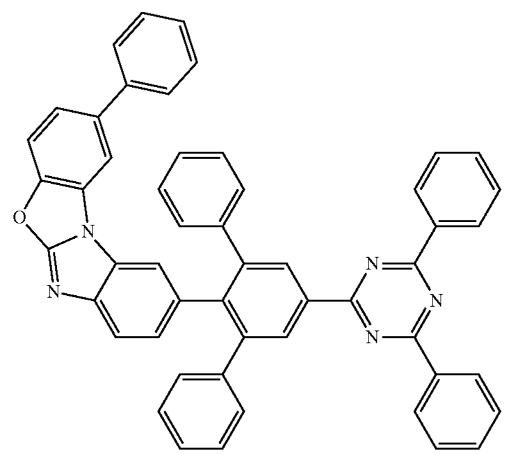
53
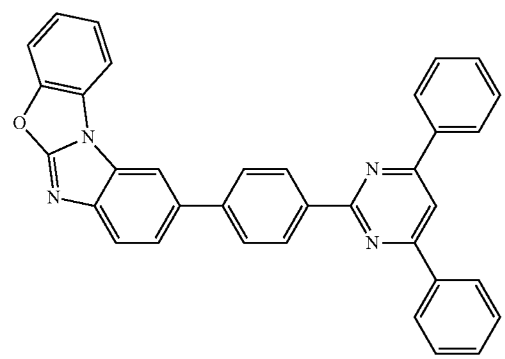
54
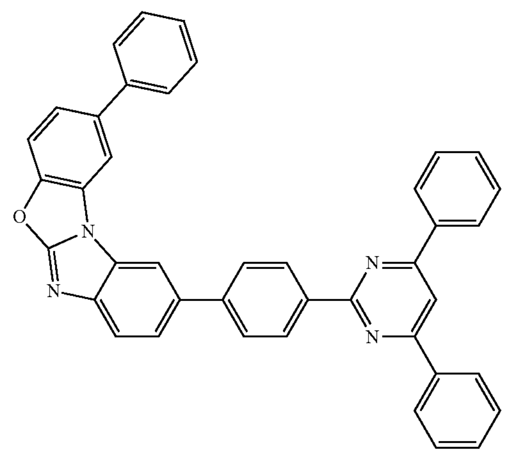

-continued
55
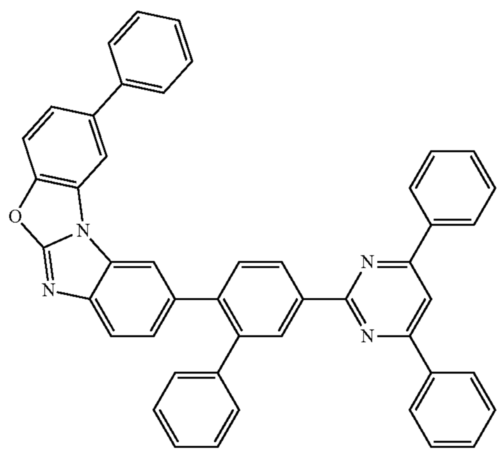
56
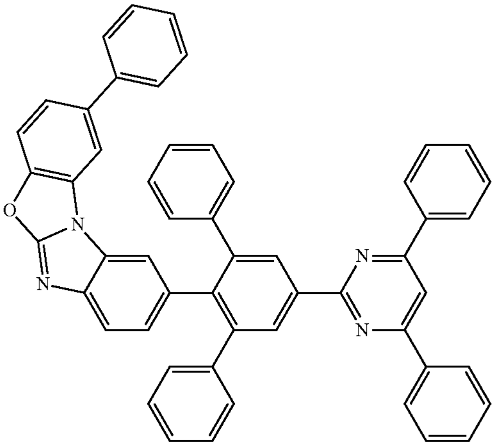
57
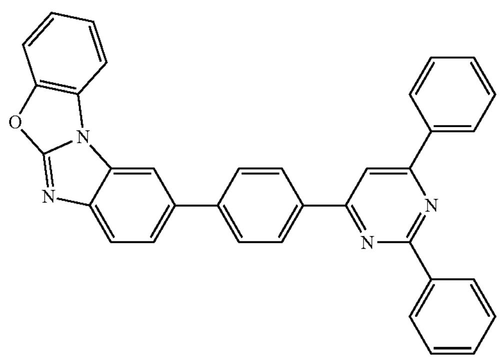
-continued
58
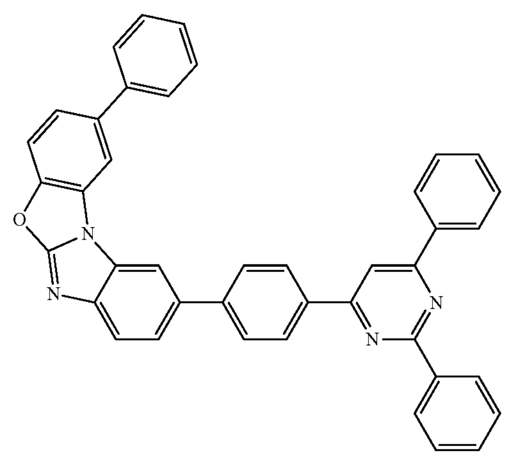
59
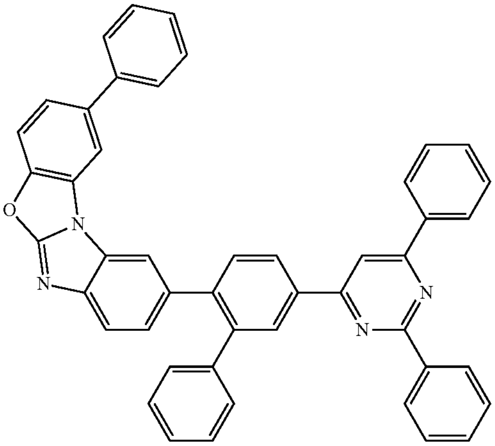
60
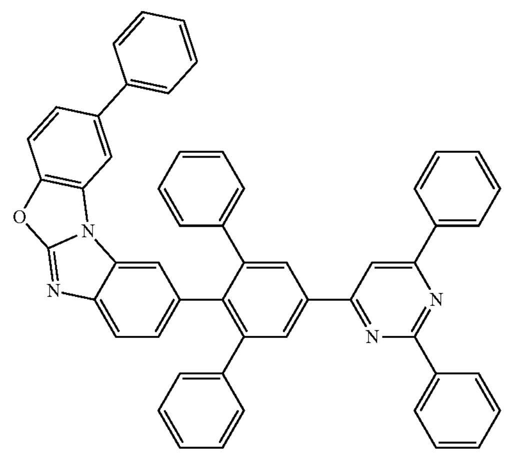

-continued
61
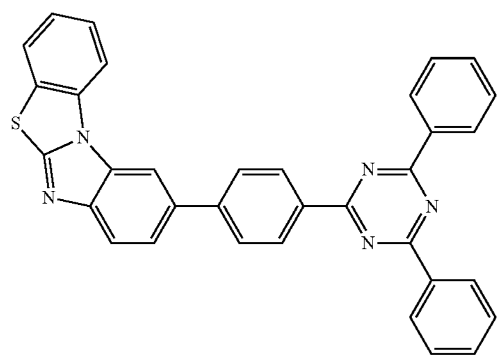
62
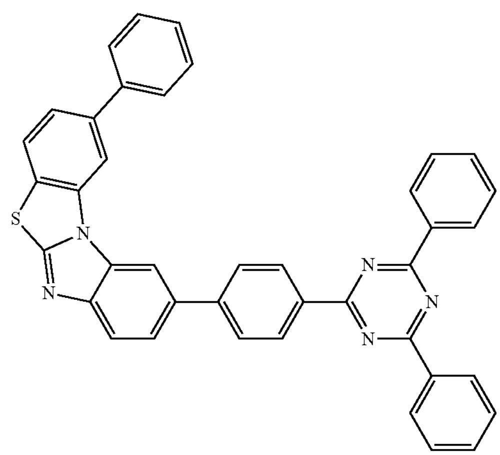
63
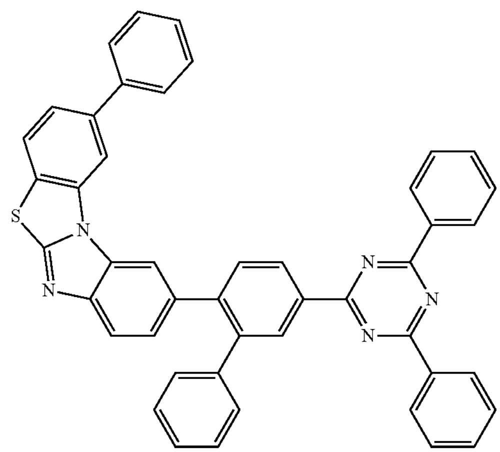
-continued
64
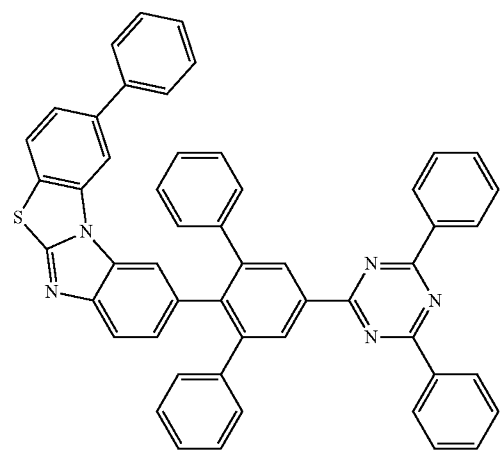
65
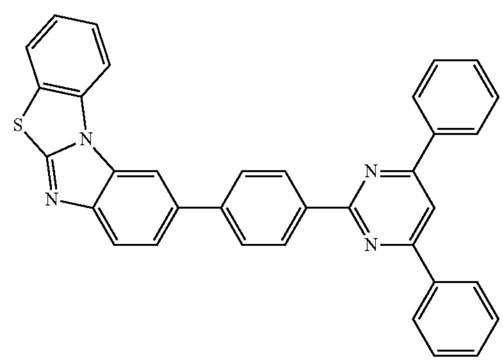
66
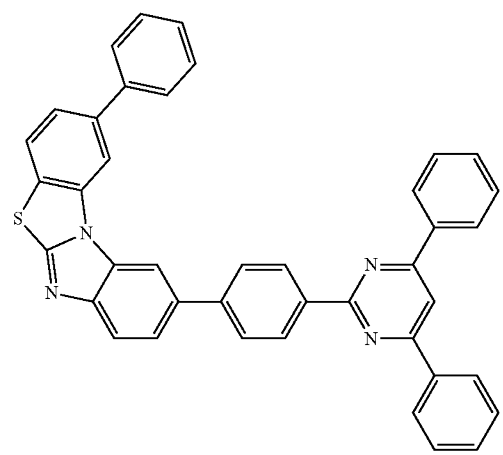

-continued
67
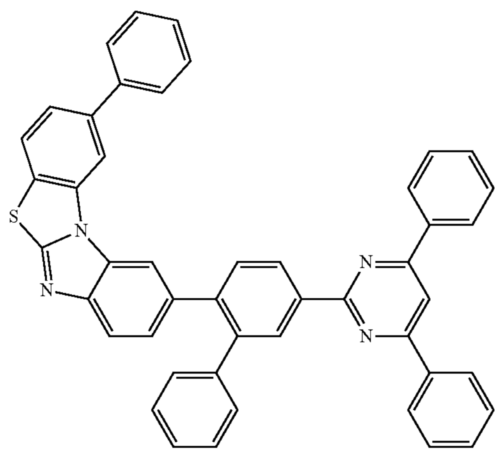
70
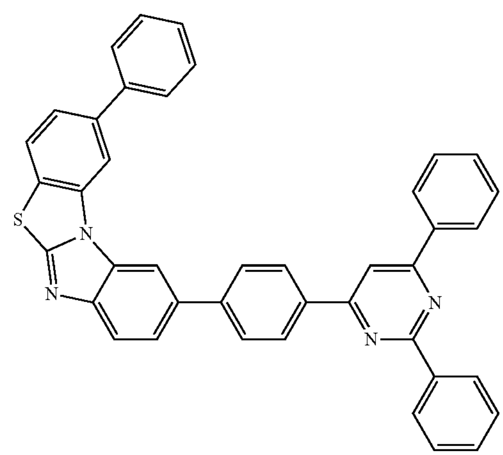
68
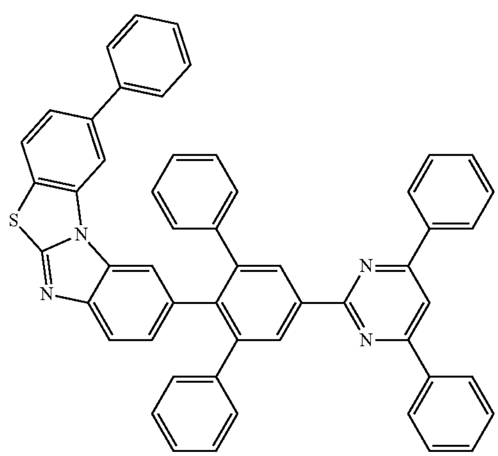
71
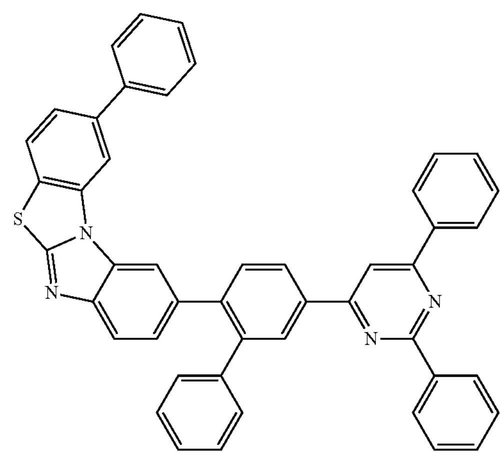
69
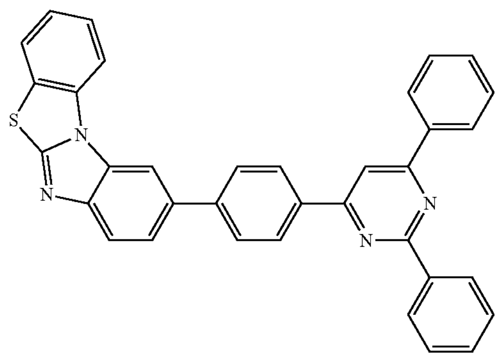
72
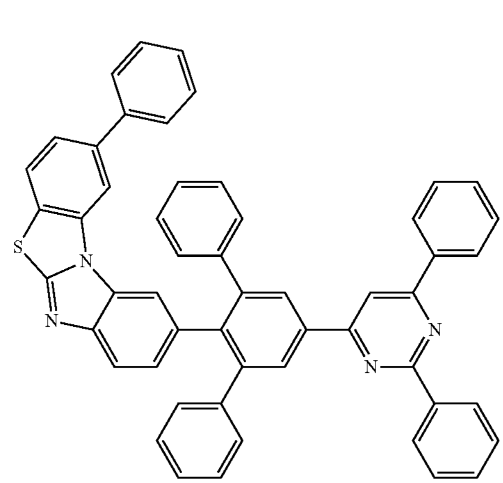

-continued
73
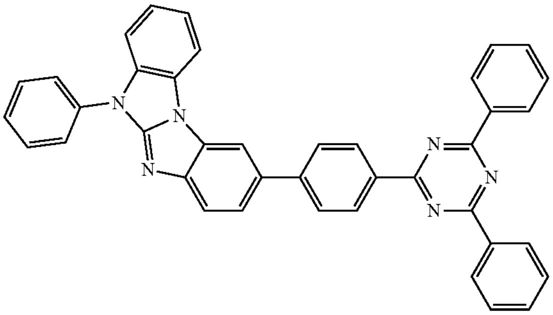
74
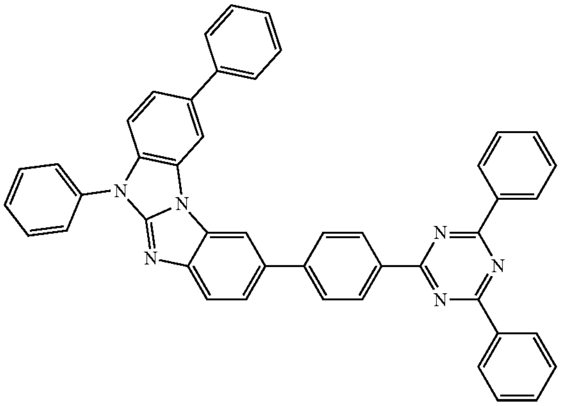
75
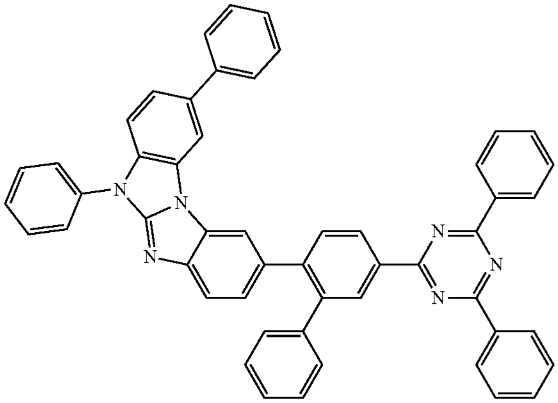
76
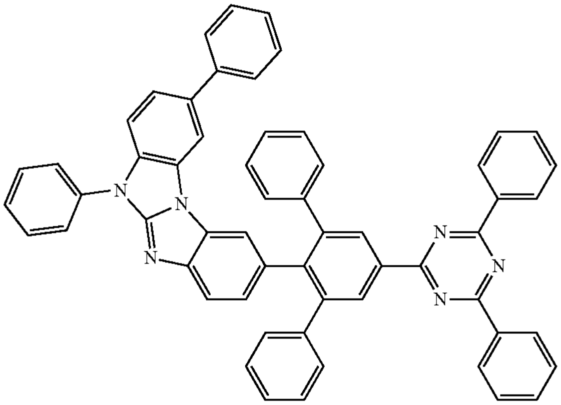
-continued
77
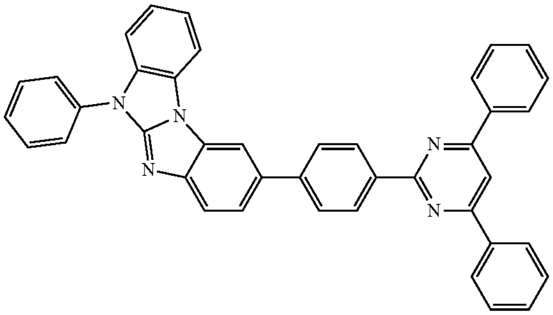
78
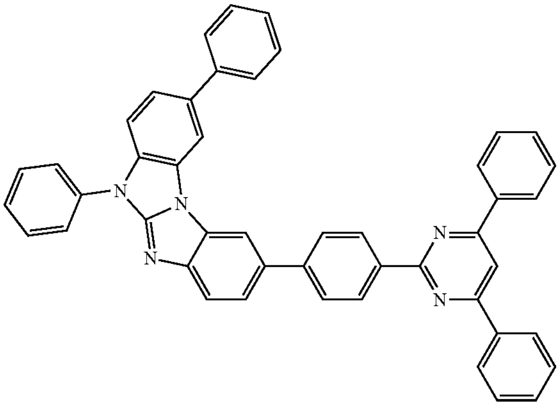
79
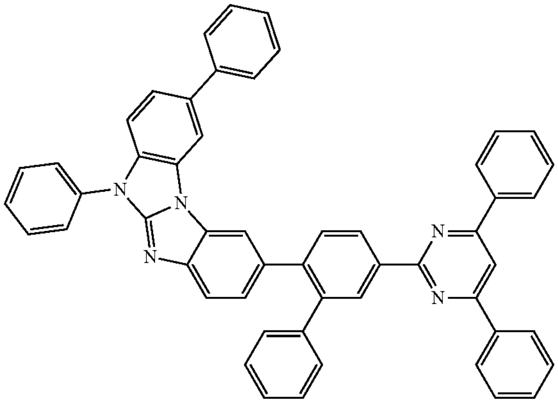
80
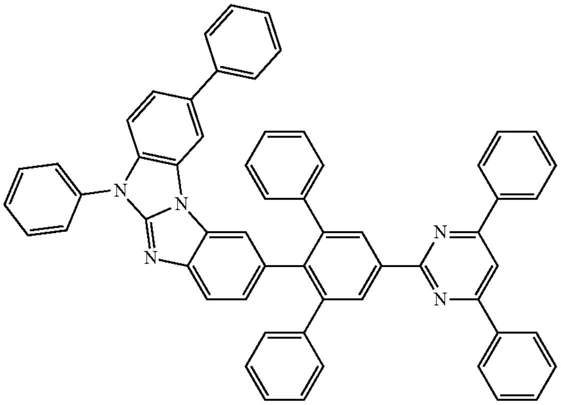

-continued
81
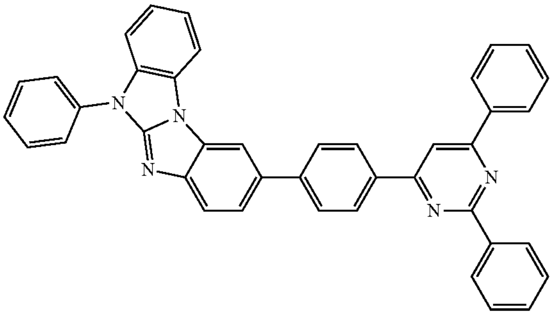
82
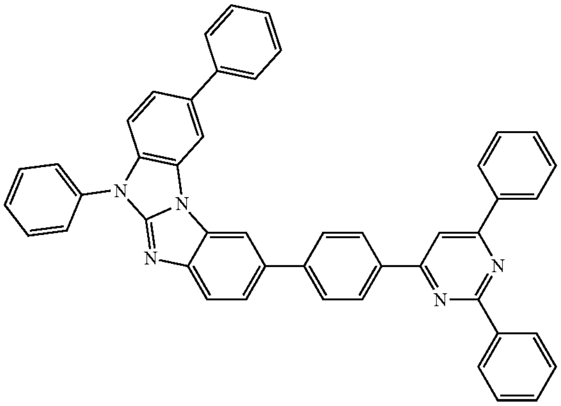
83
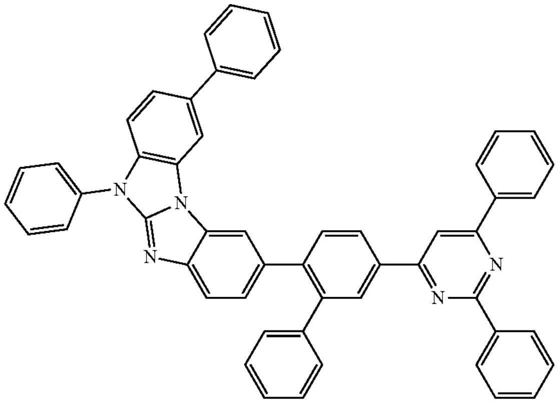
84
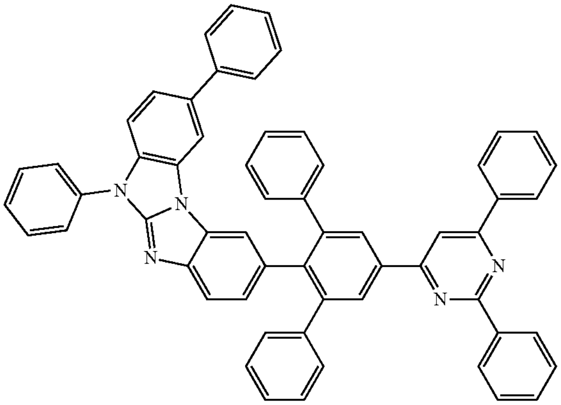
85
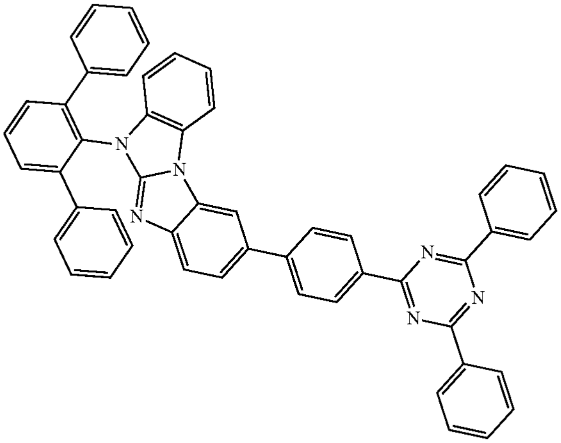
86
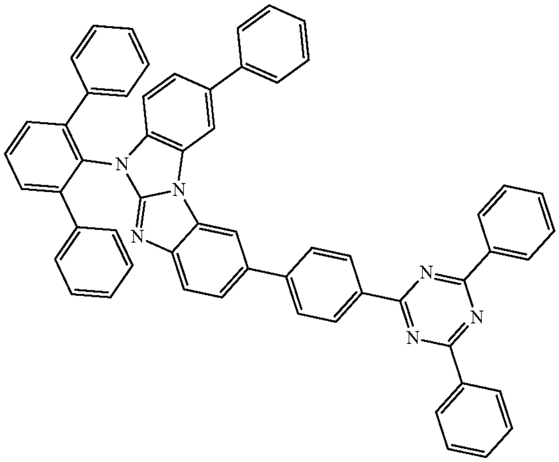
87
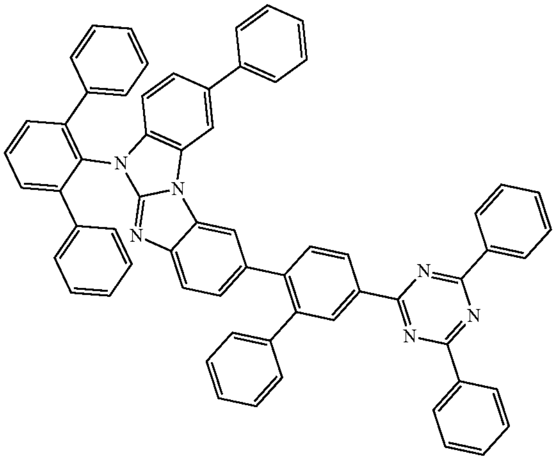

-continued
88
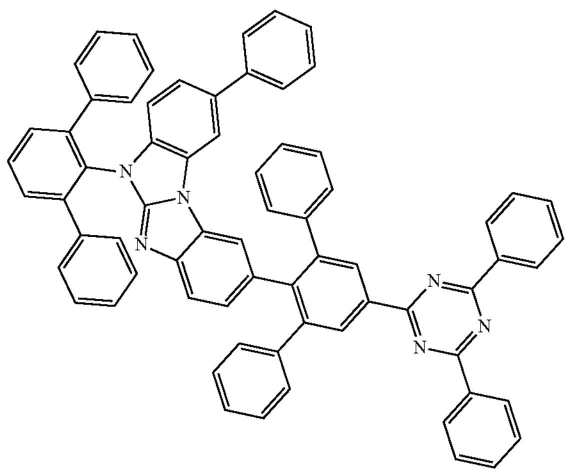
89
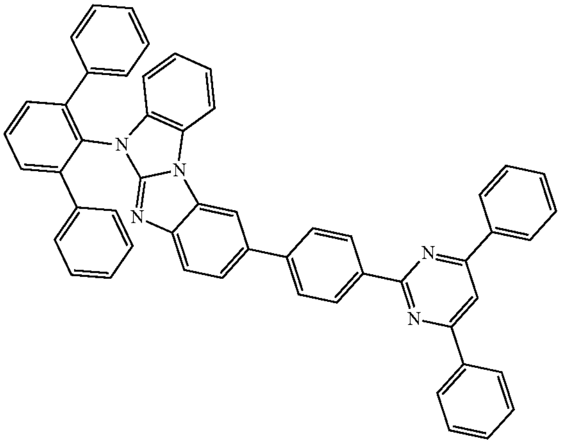
90
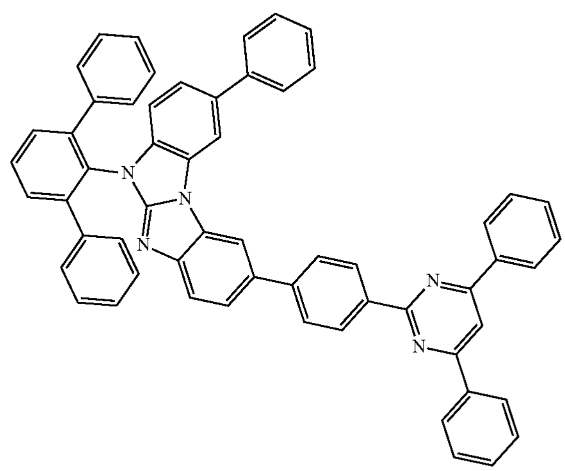
-continued
91
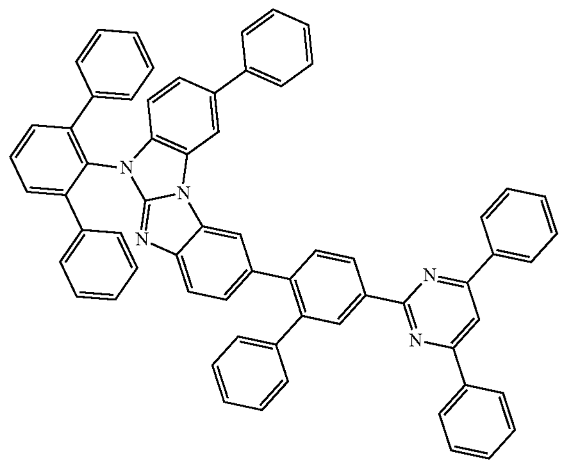
92
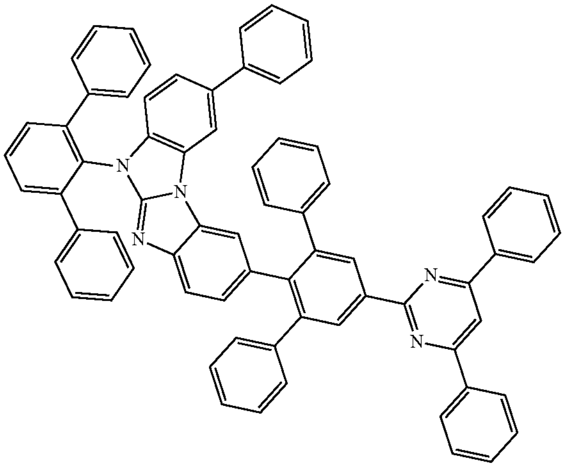
93
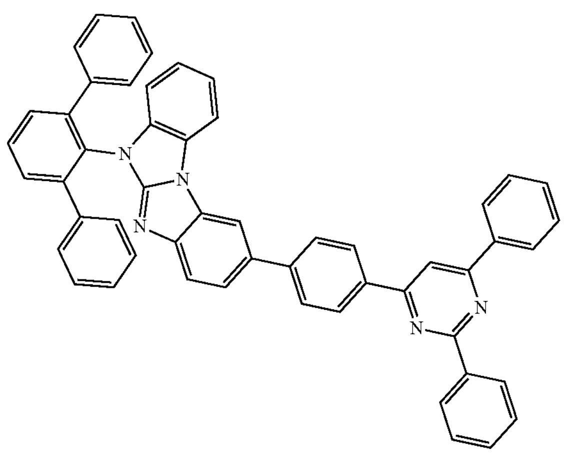

-continued
94
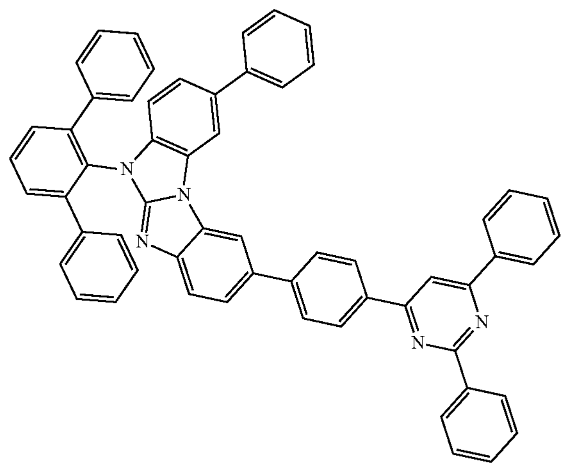
95
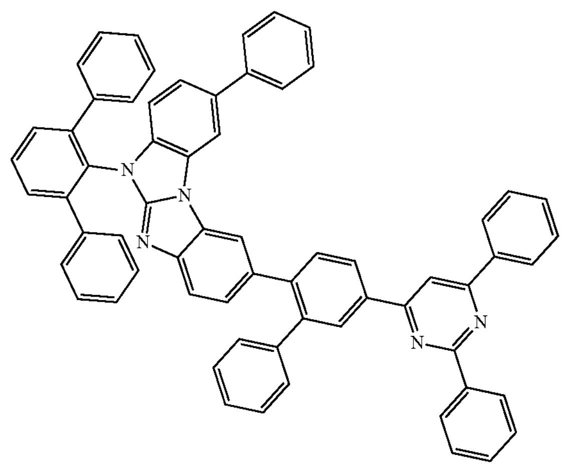
96
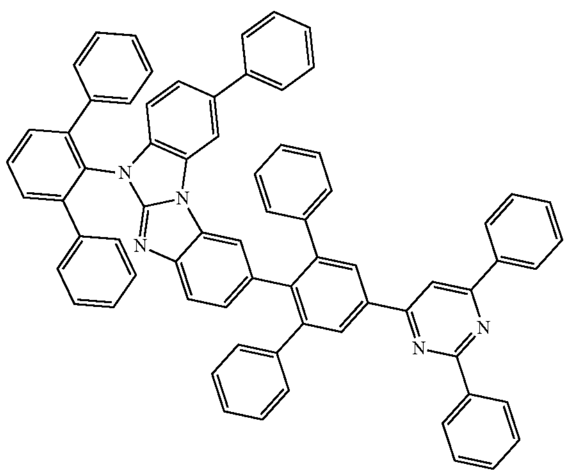
-continued
97
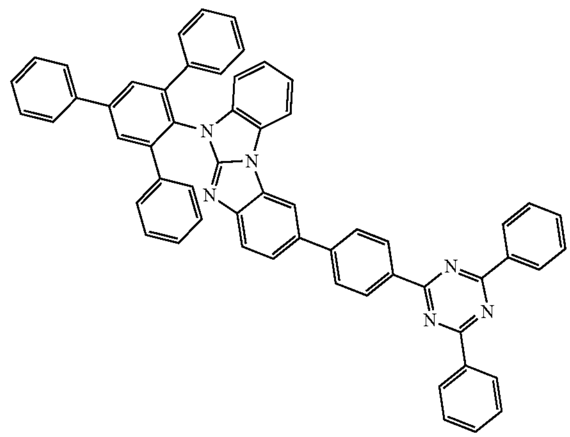
98
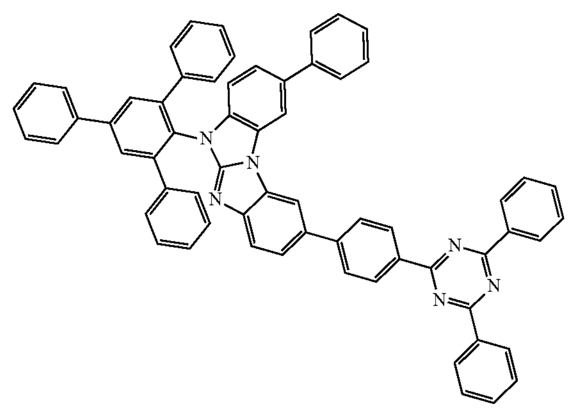
99
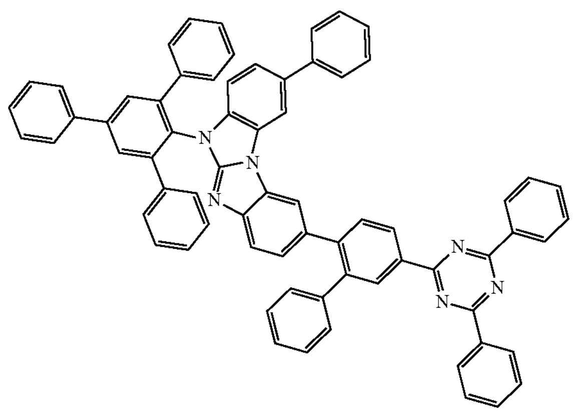

100
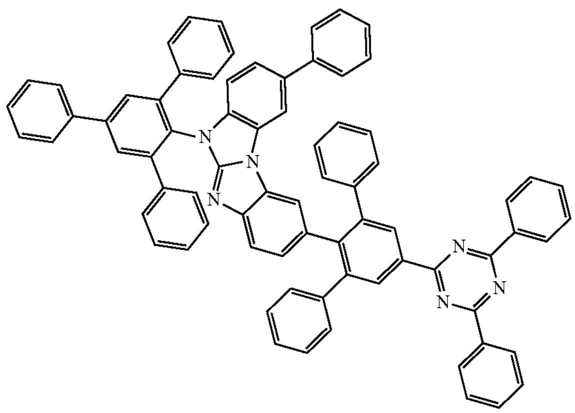
101
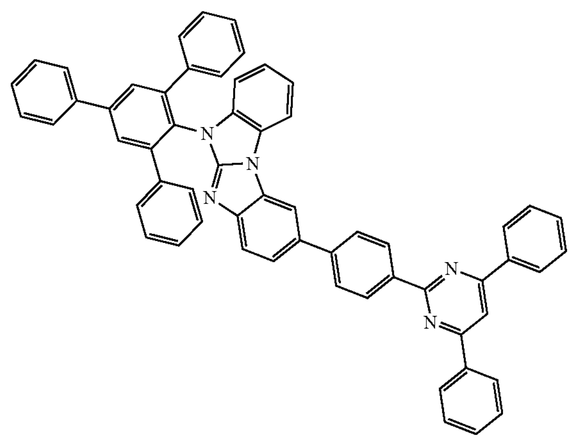
102
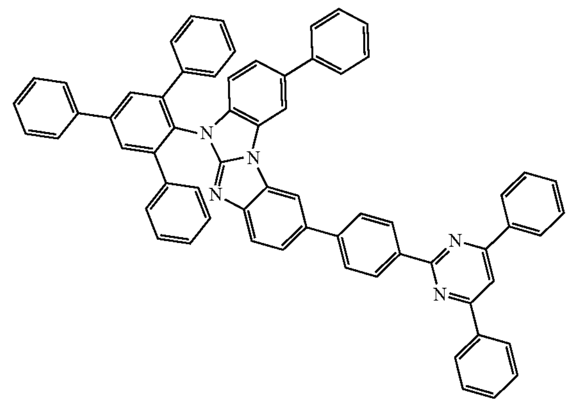
103
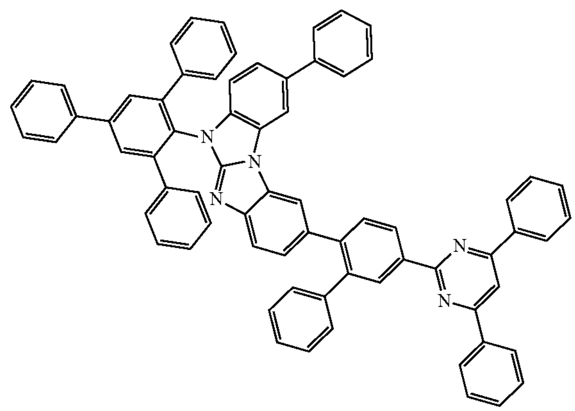
104
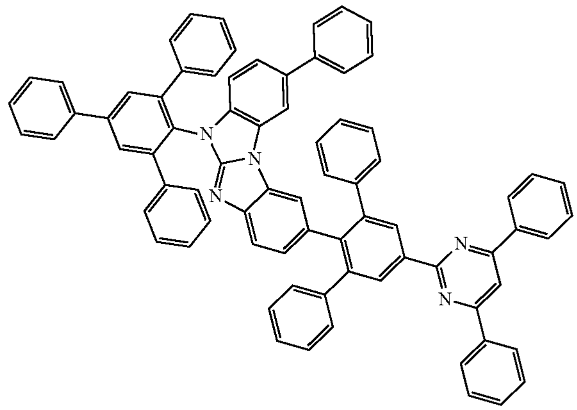
105
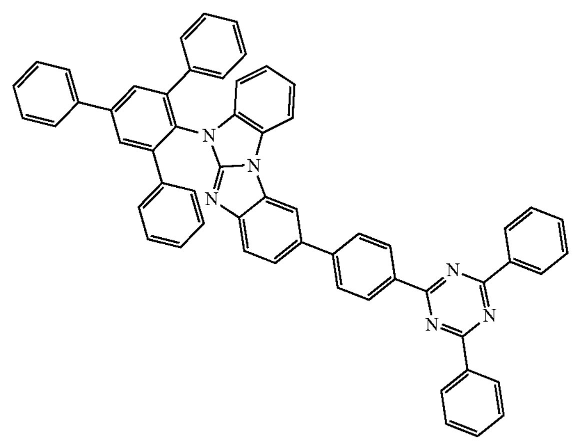

-continued
106
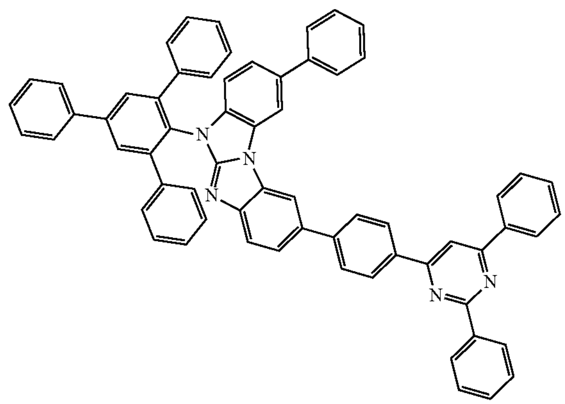
107
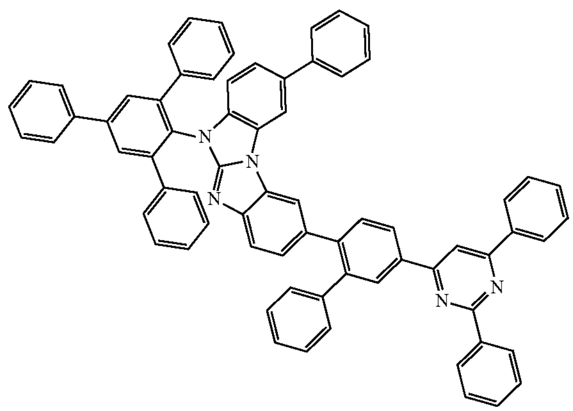
108
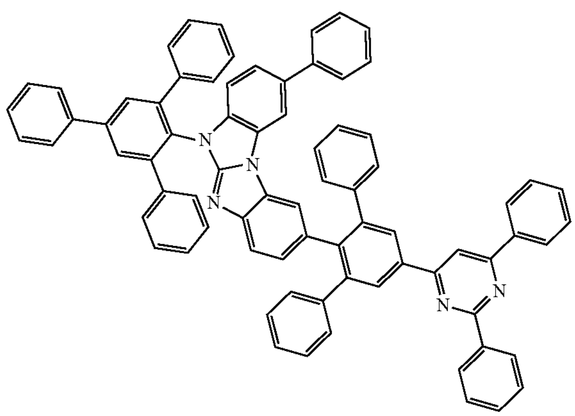
-continued
109
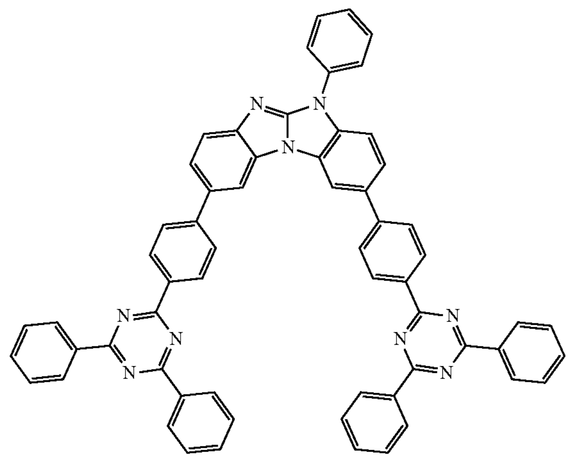
110
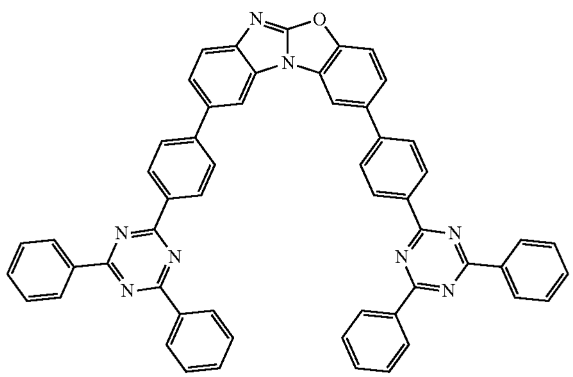
111
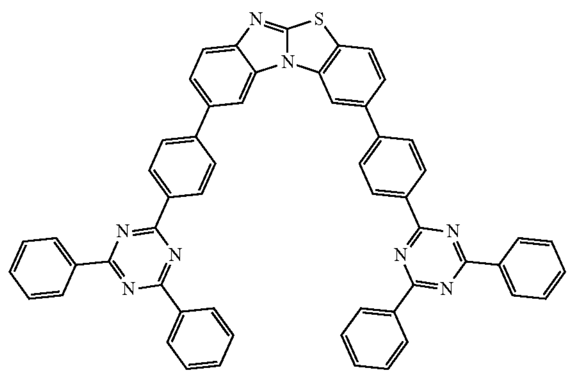

-continued
112
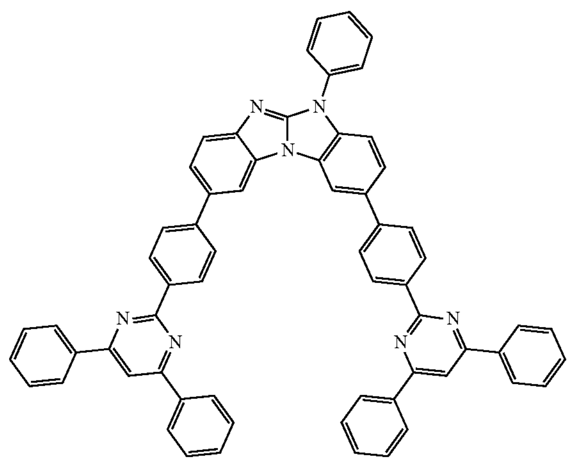
113
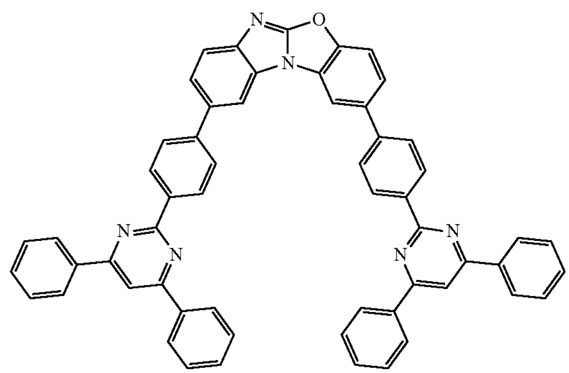
114
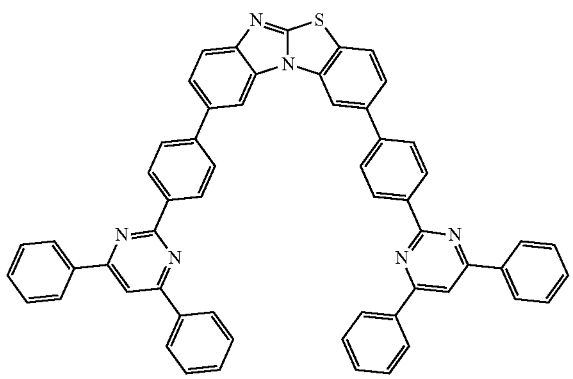
-continued
115
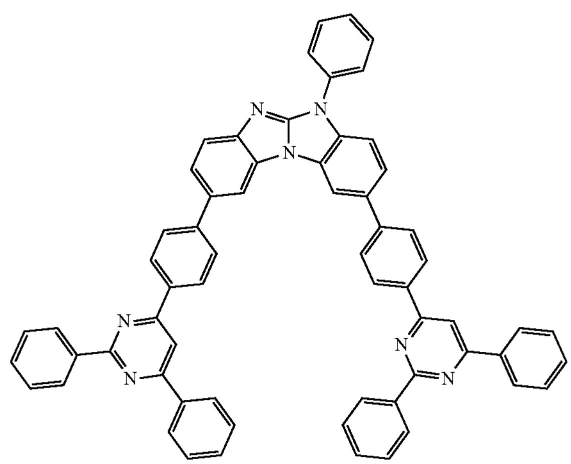
116
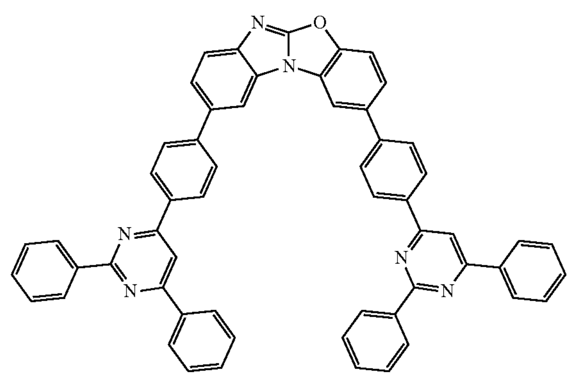
117
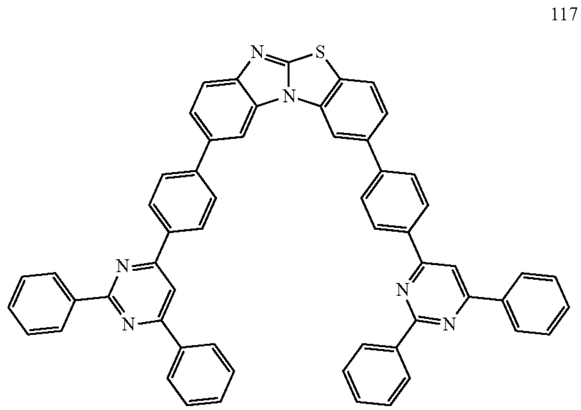

Group XII
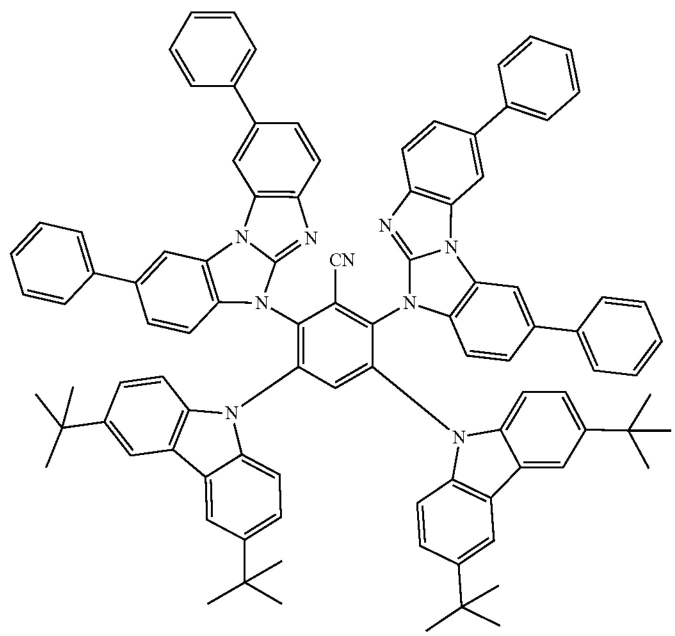
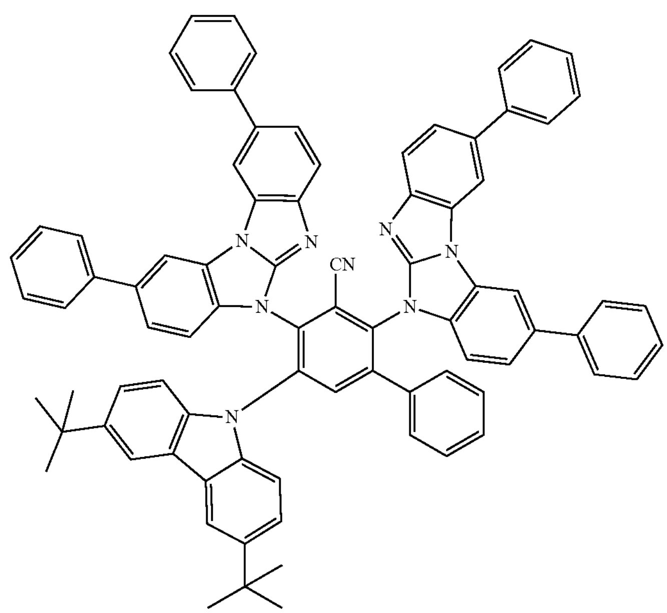

-continued
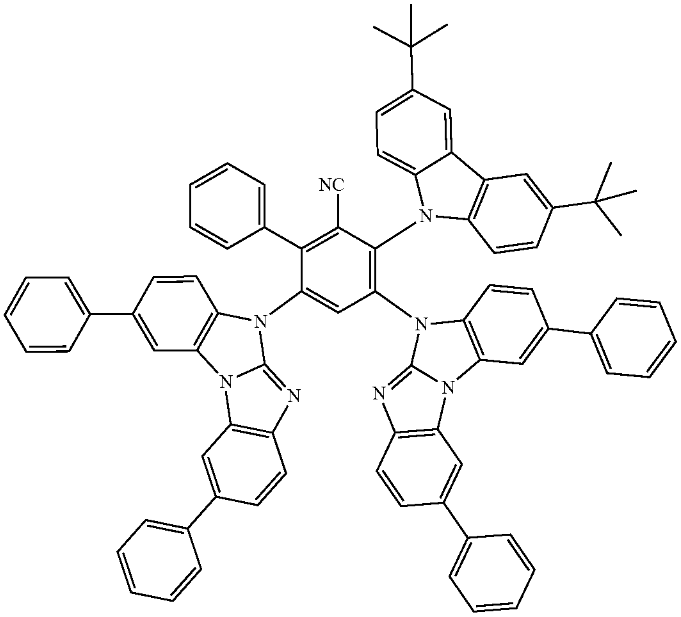
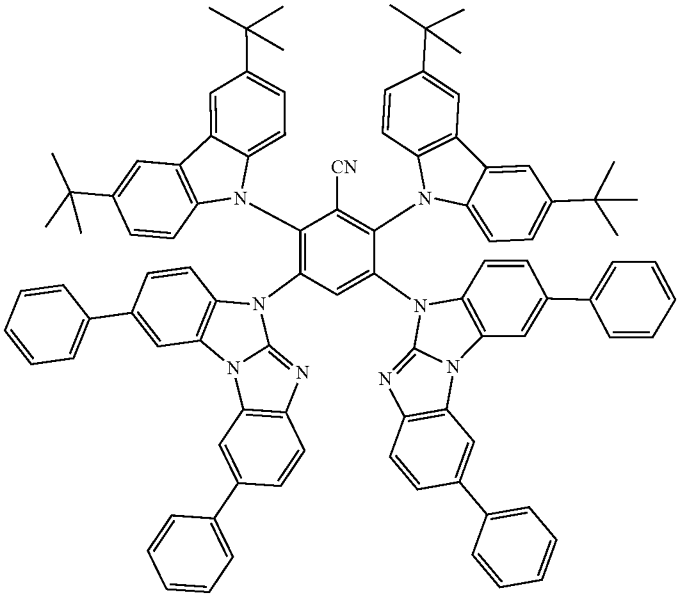
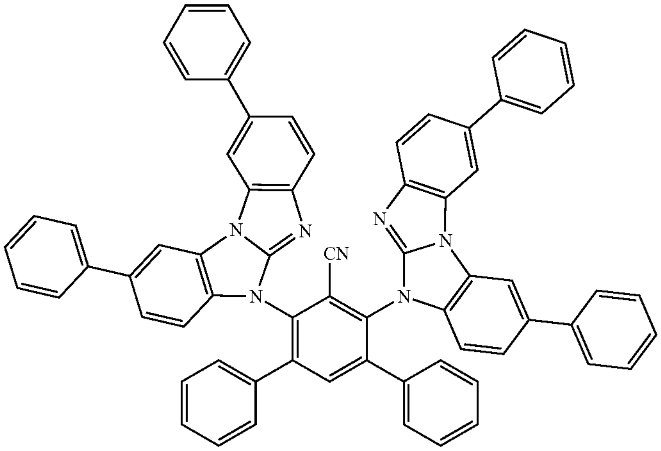

-continued
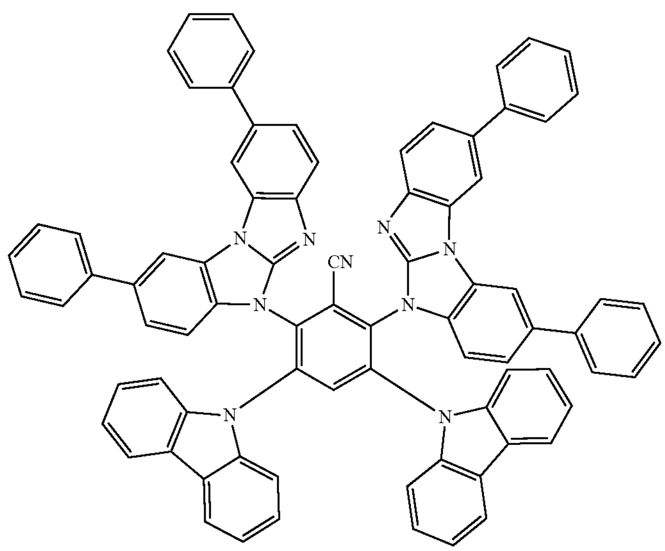
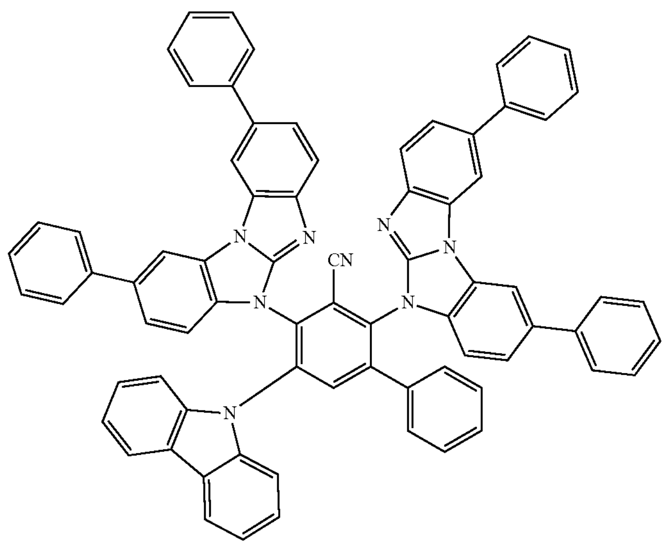
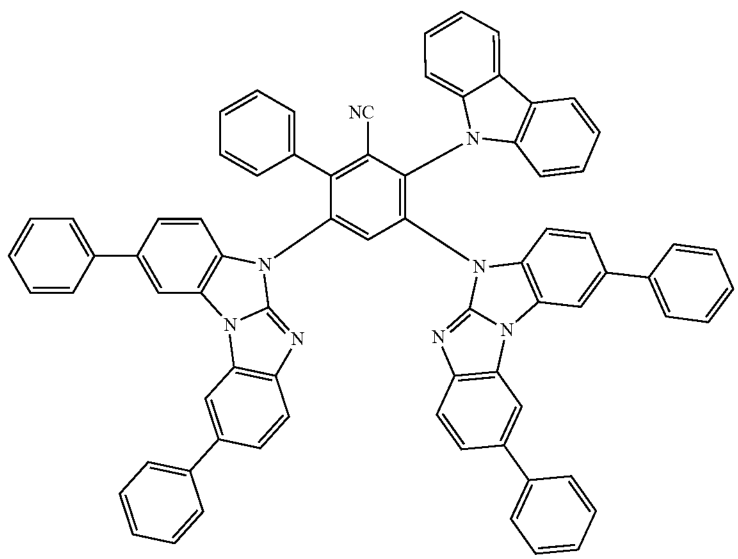

-continued
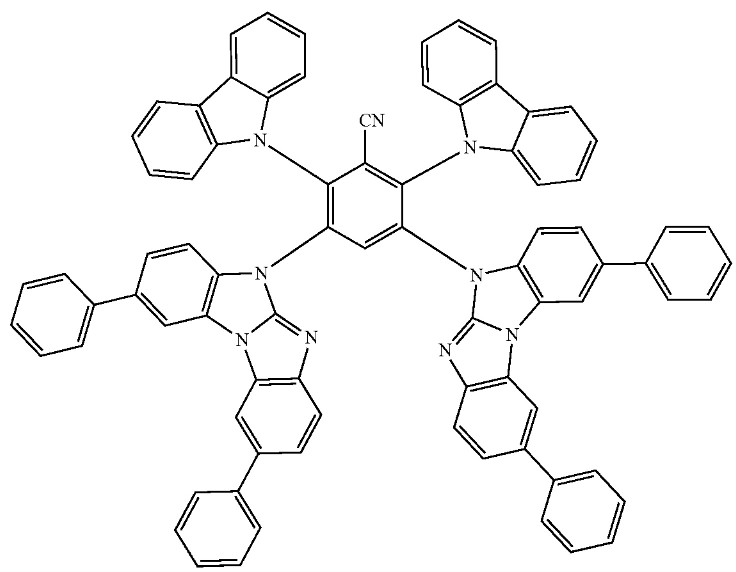
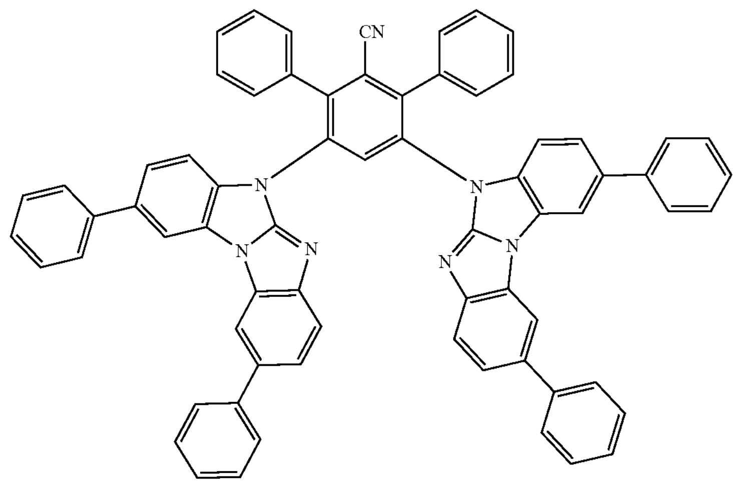
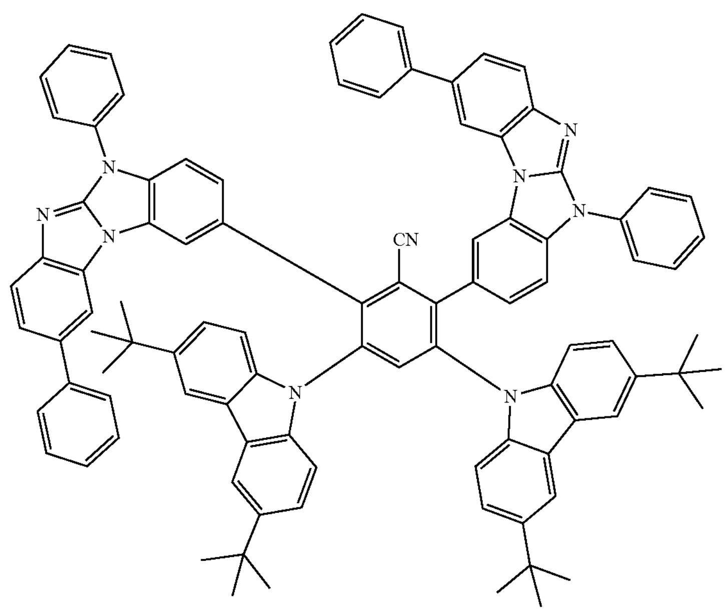

-continued
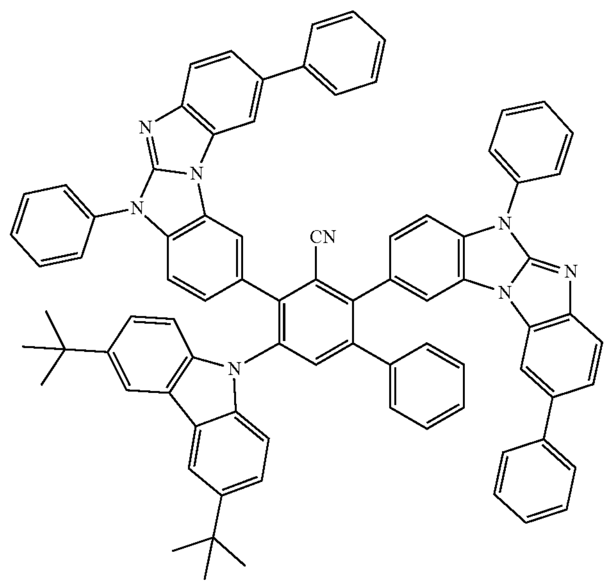
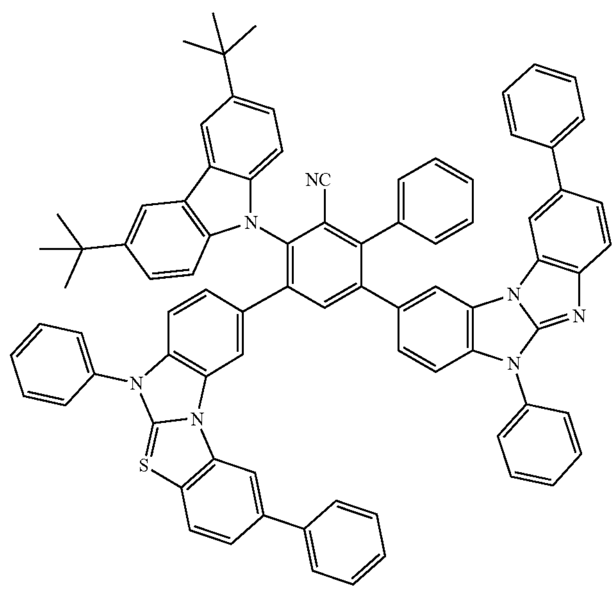

-continued
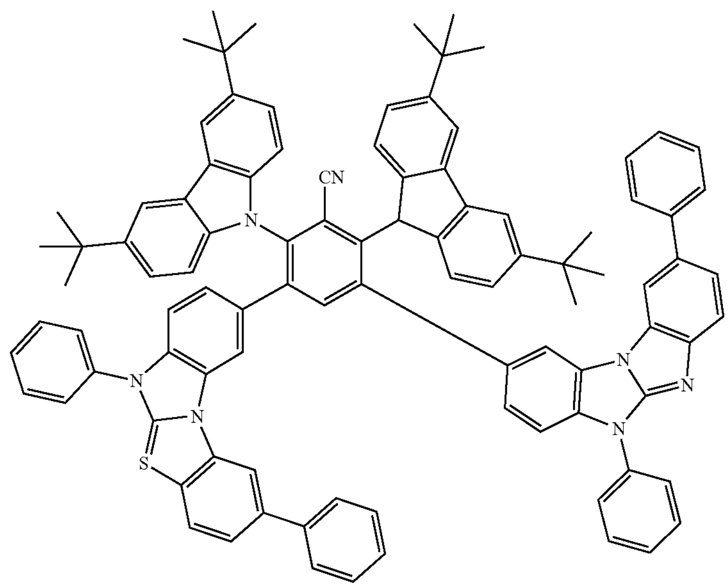
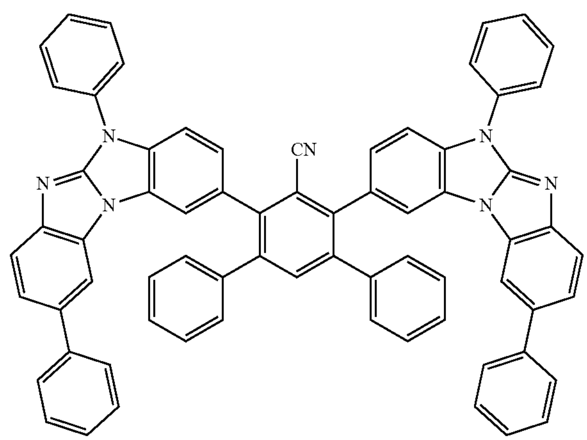
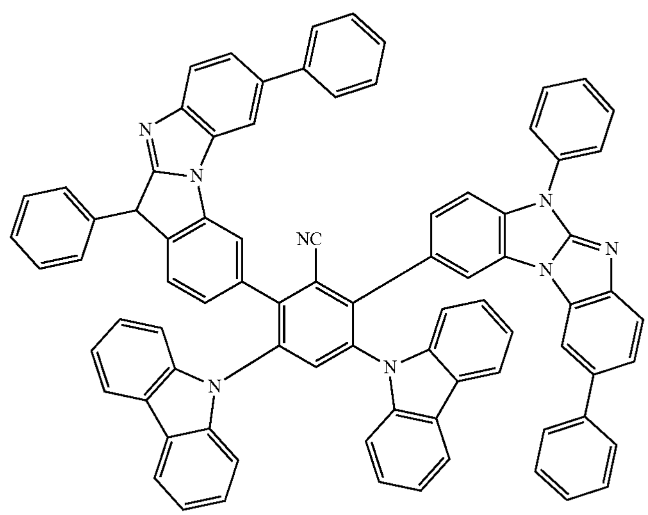

-continued
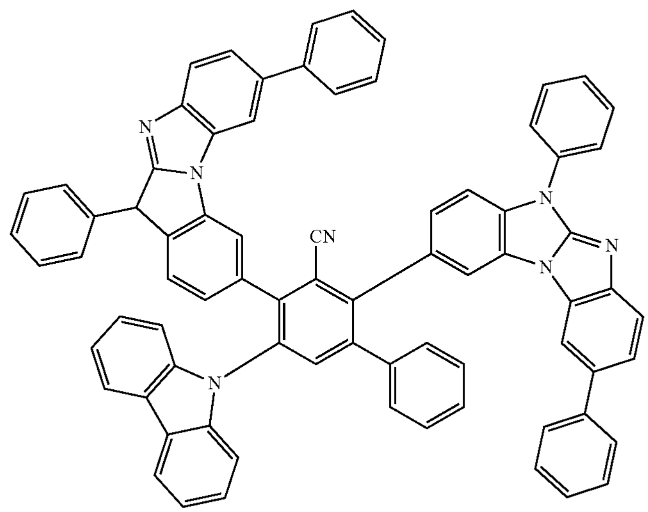
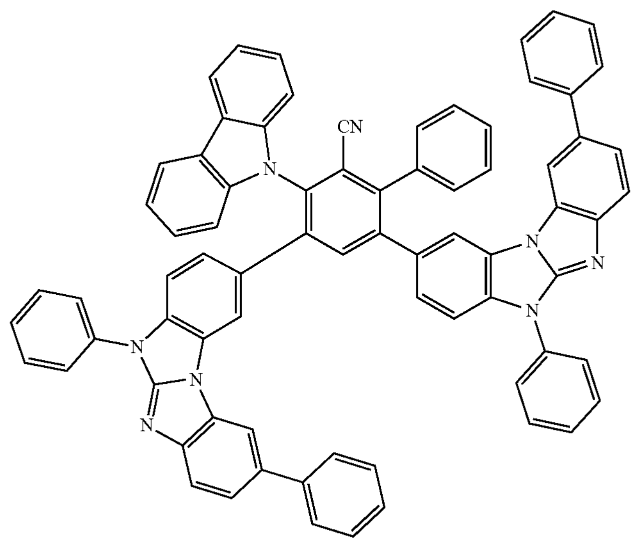
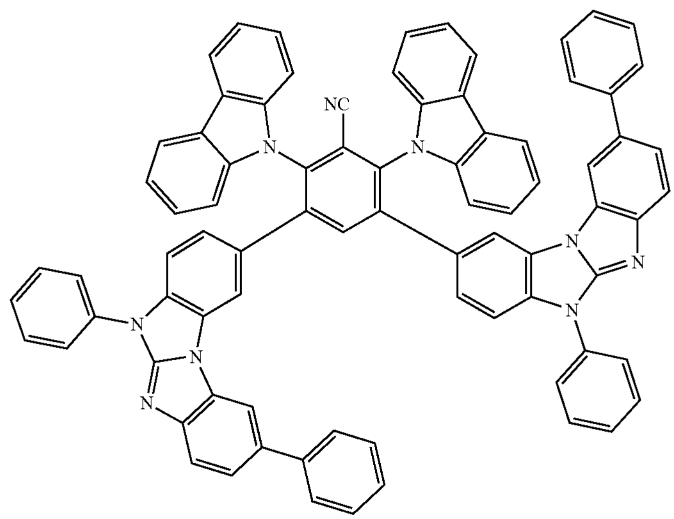

-continued
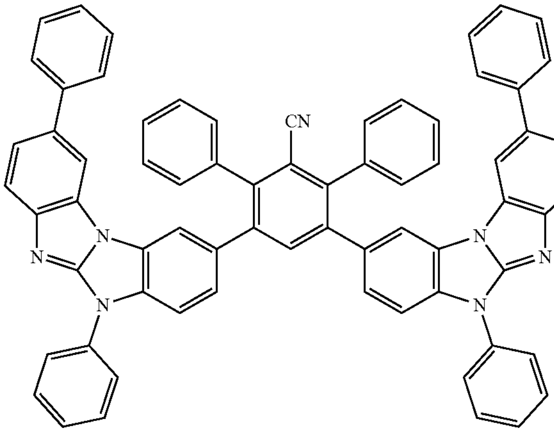
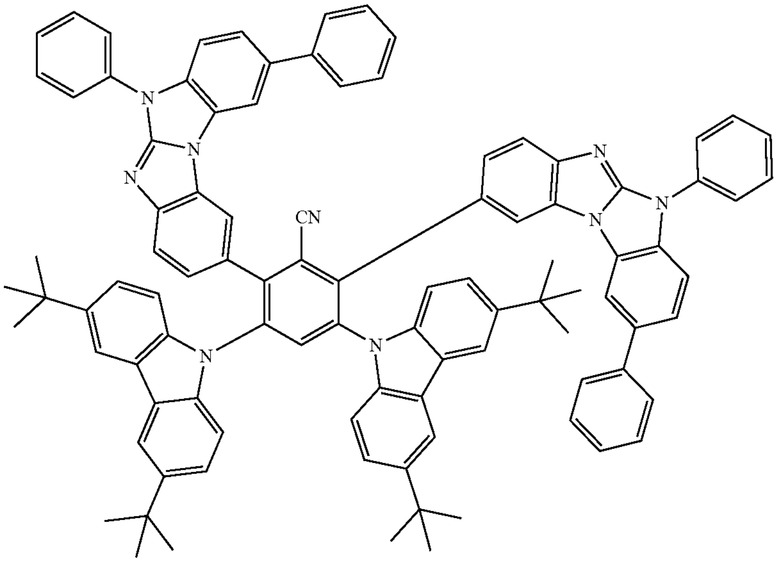
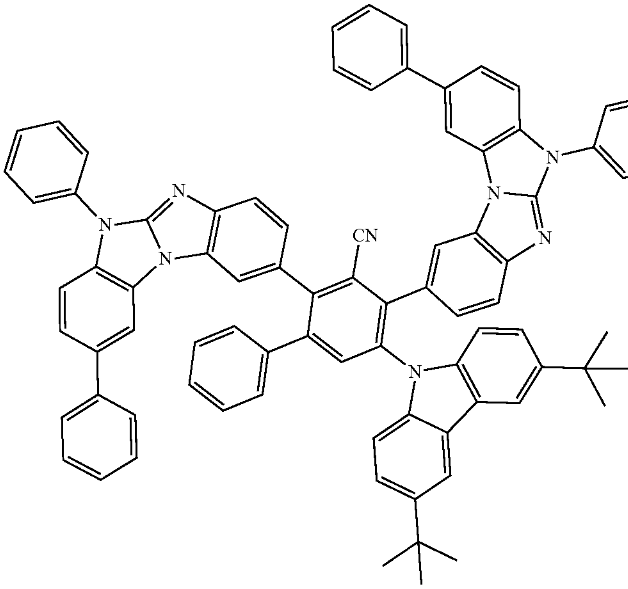

-continued
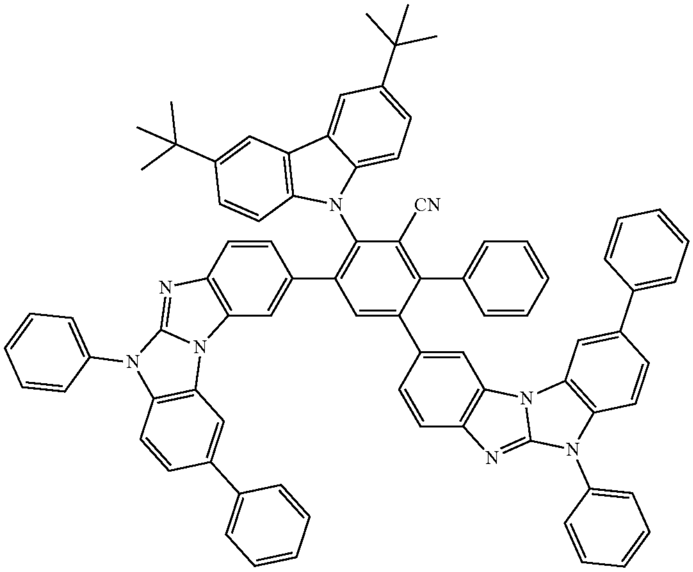
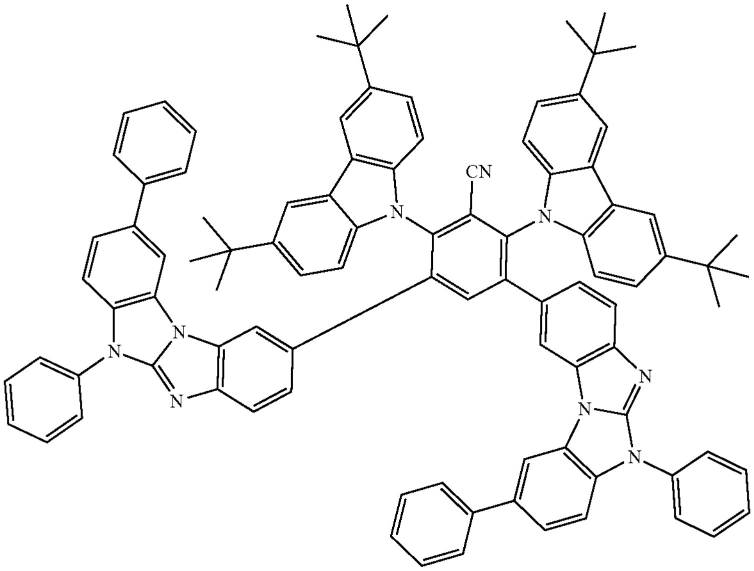
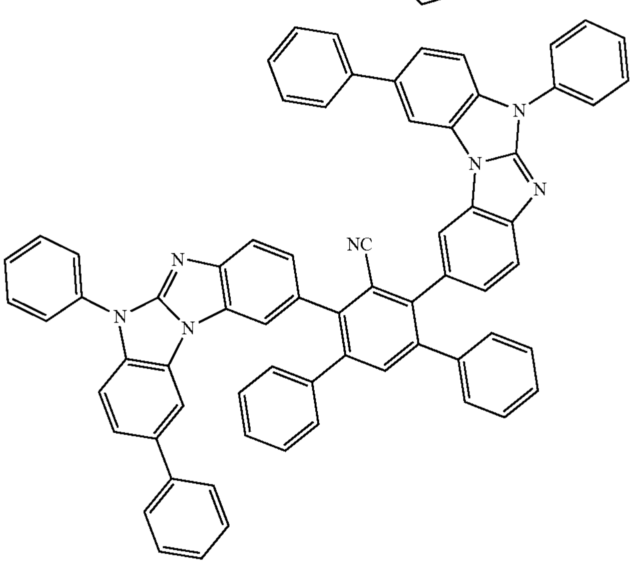

-continued
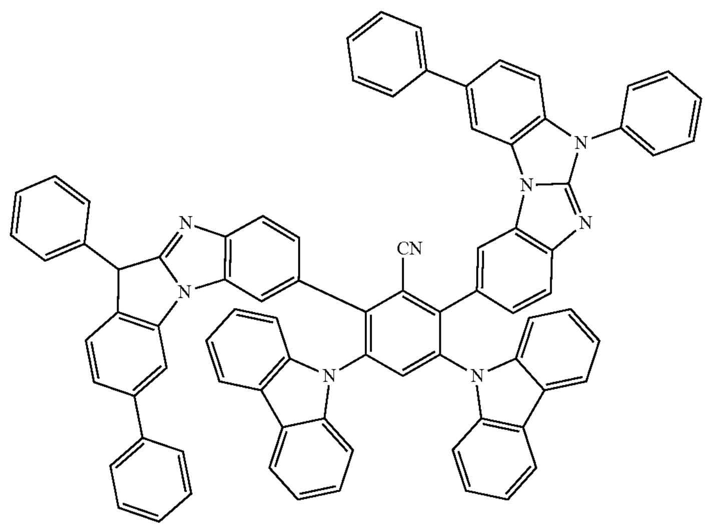
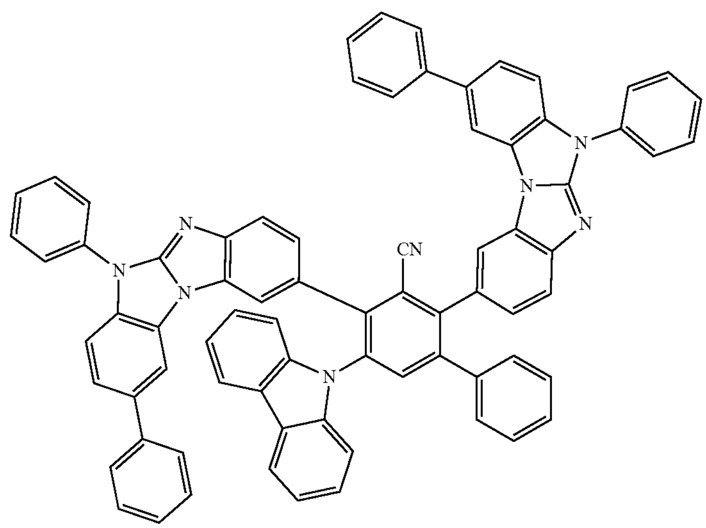
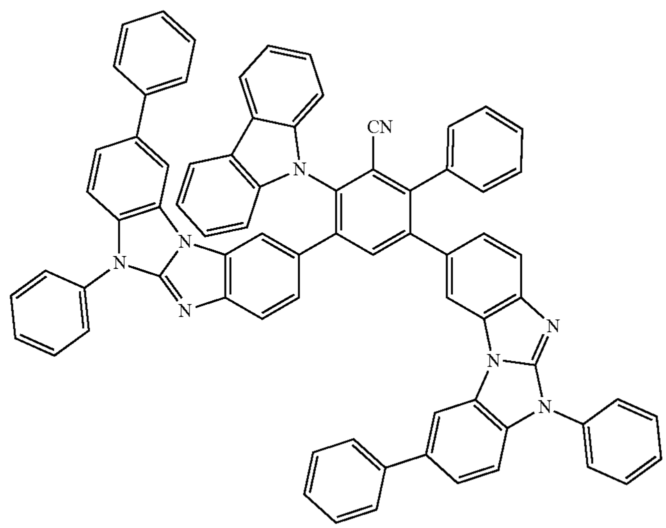

-continued
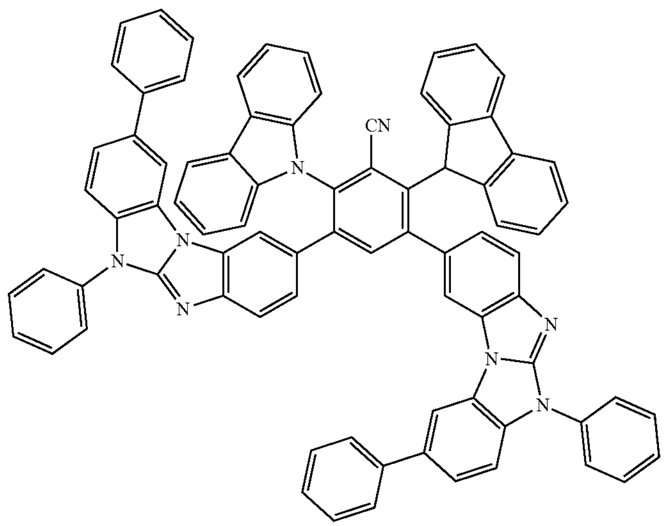
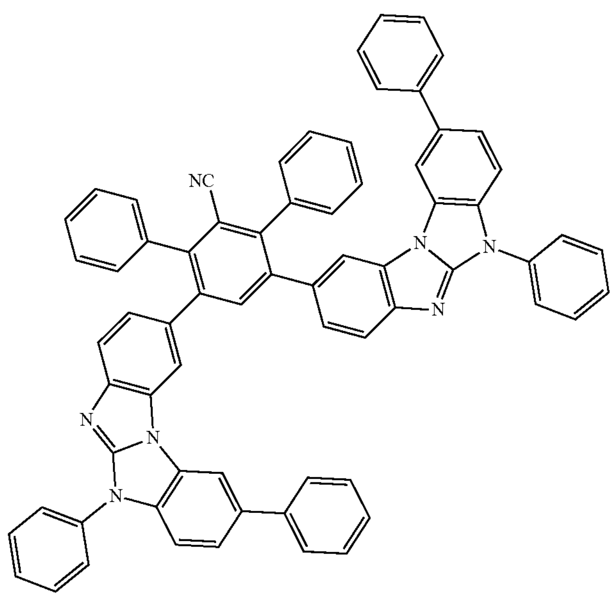

-continued
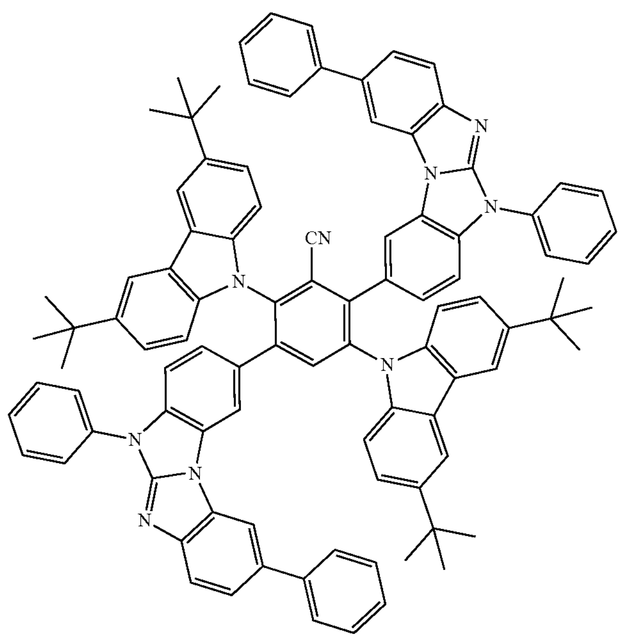
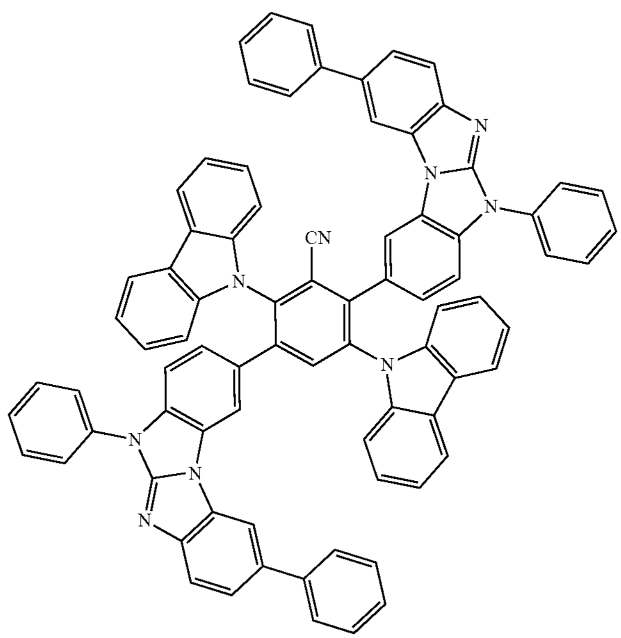

-continued
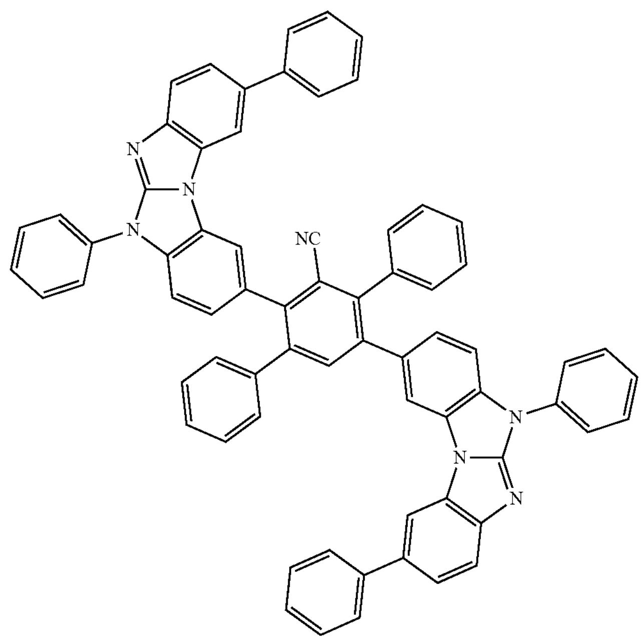
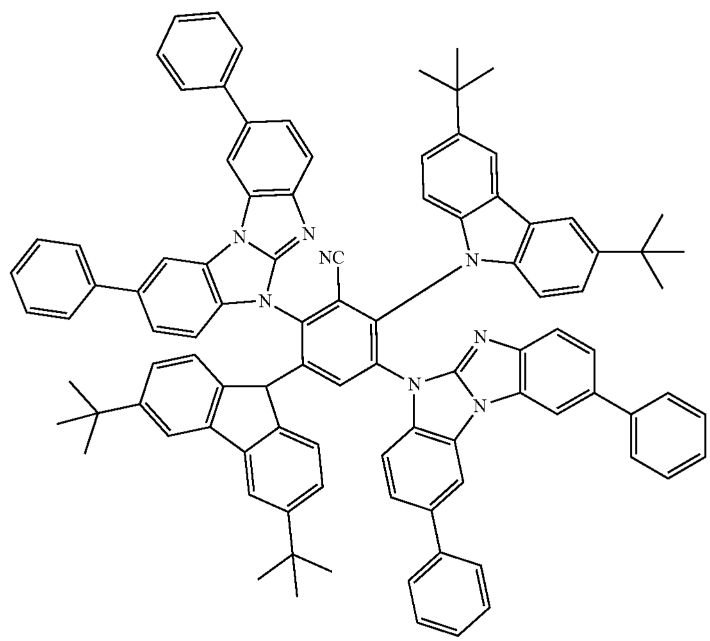

-continued
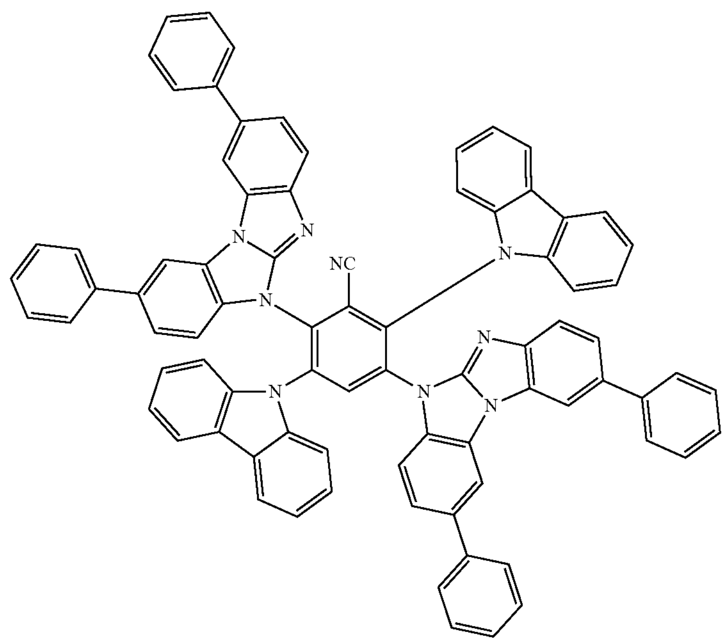
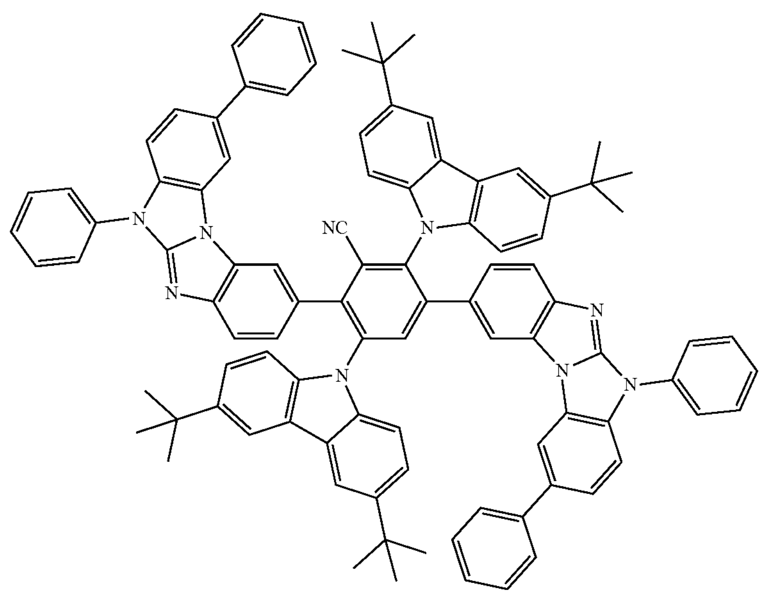

-continued
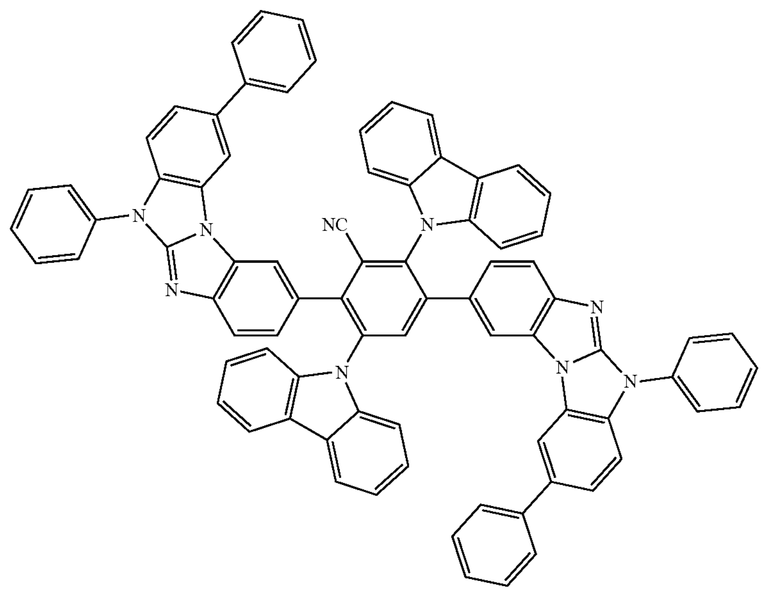
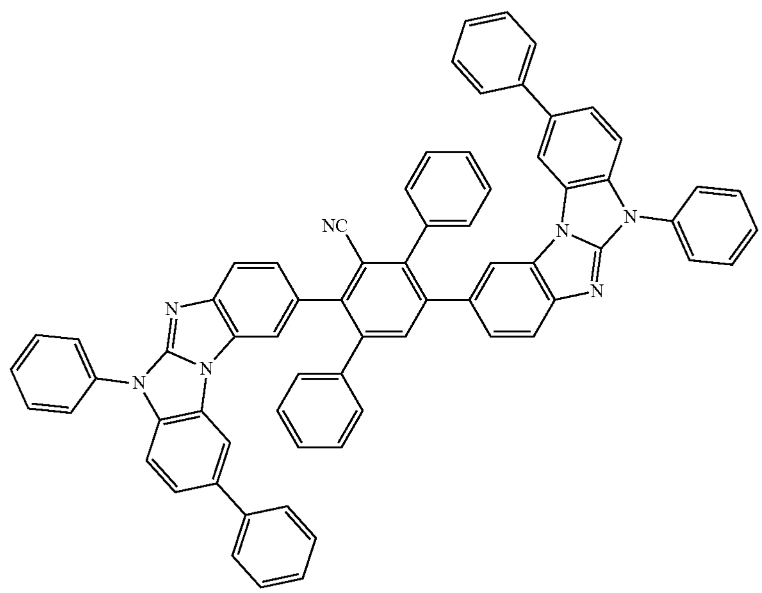

-continued
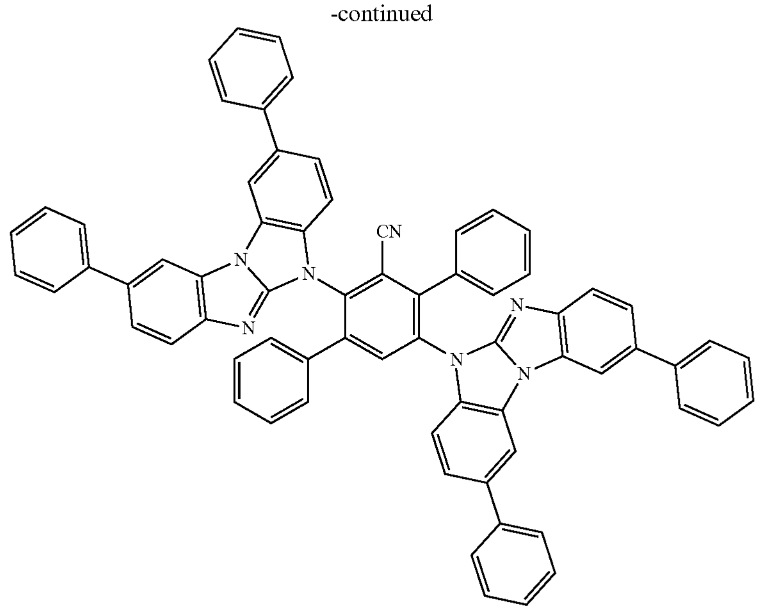
-continued
Group XIII
1
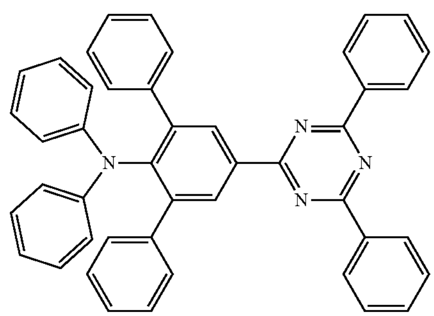
2
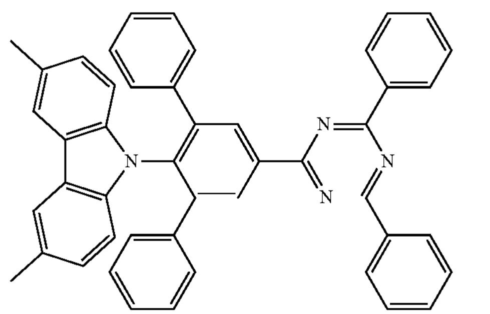
3
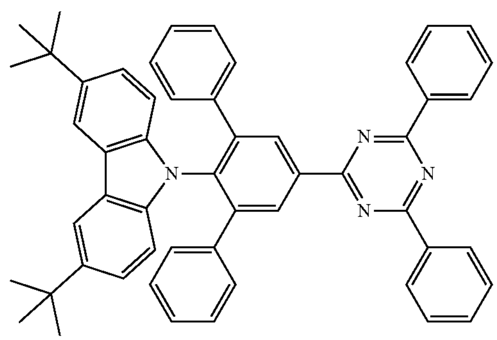
4
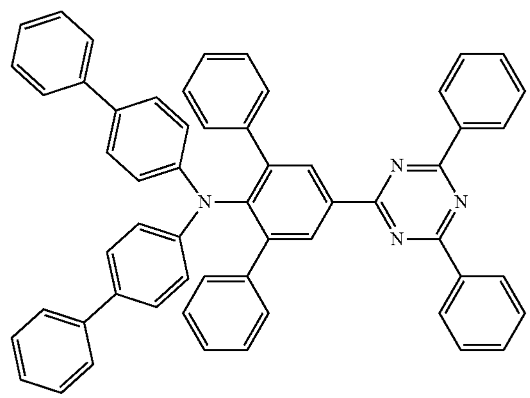
5
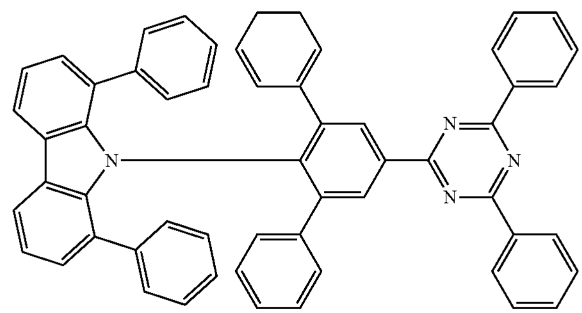

-continued
6
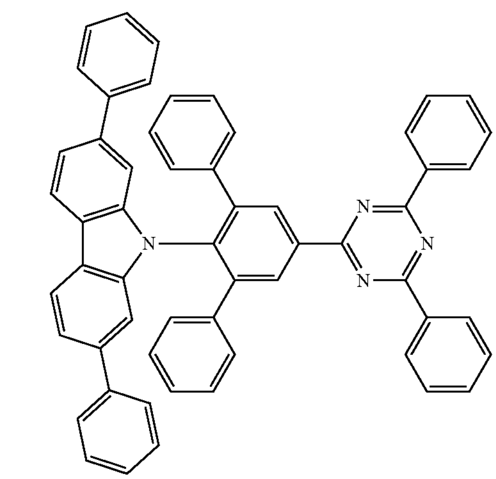
7
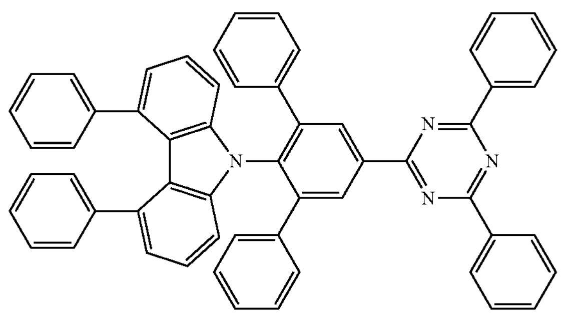
8
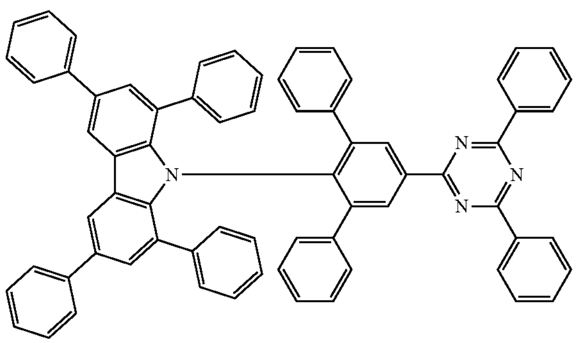
9
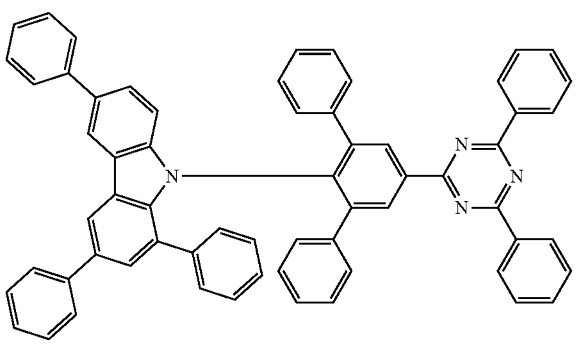
-continued
10
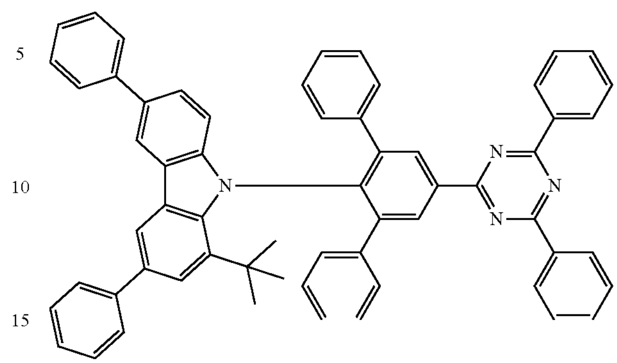
11
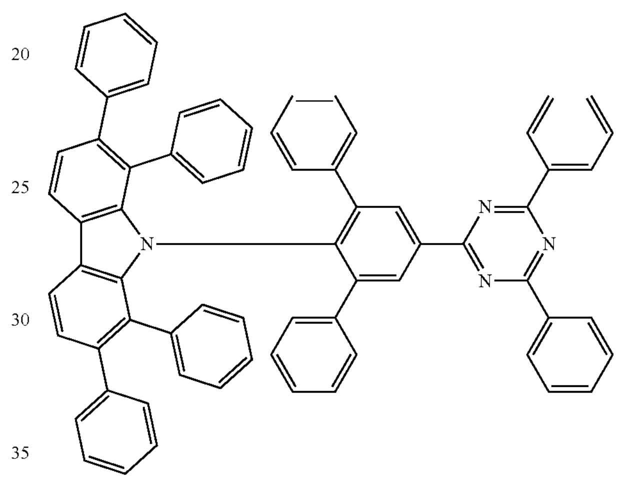
12
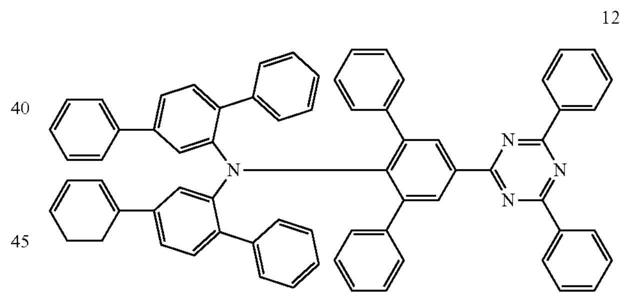
13
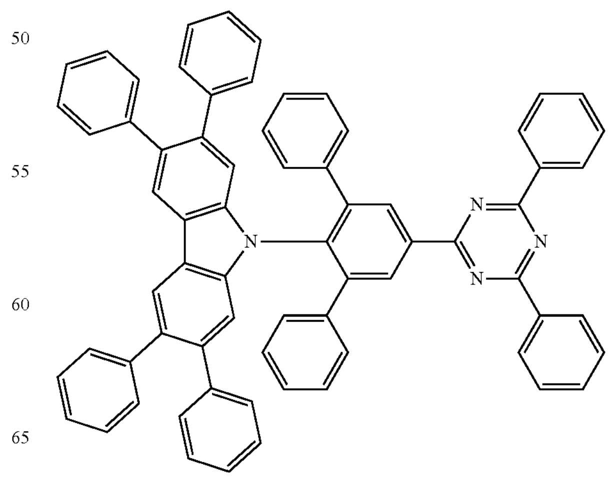

-continued
14
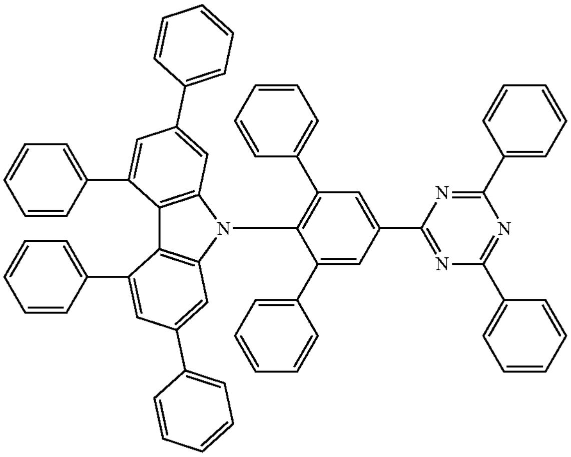
15
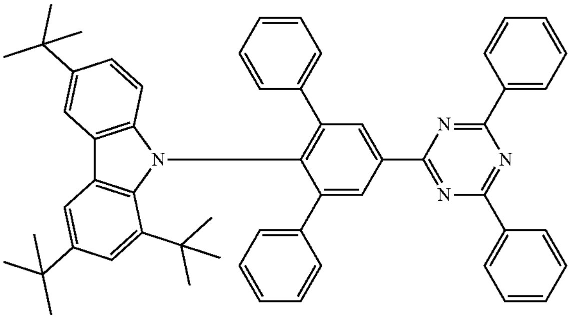
16
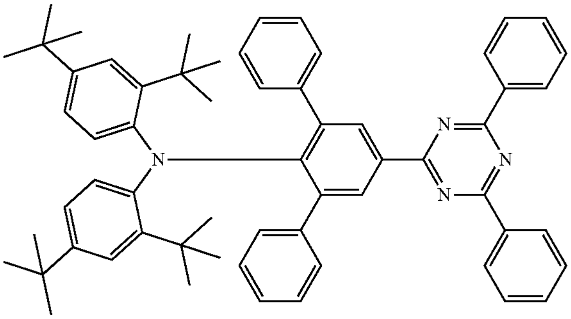
17
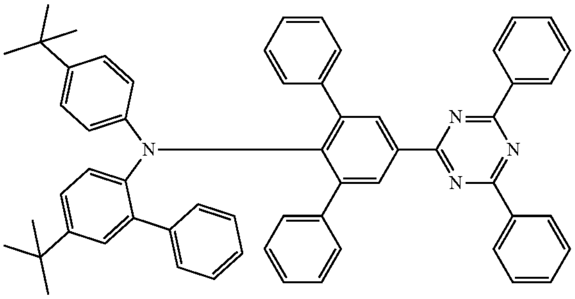
-continued
18
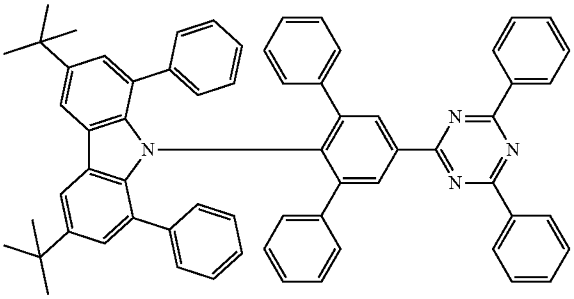
19
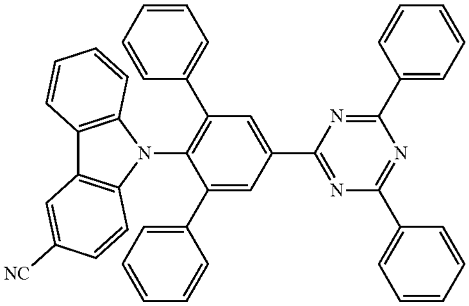
20
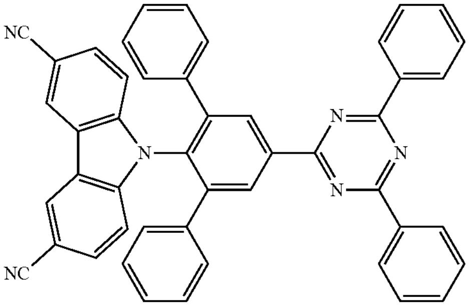
21
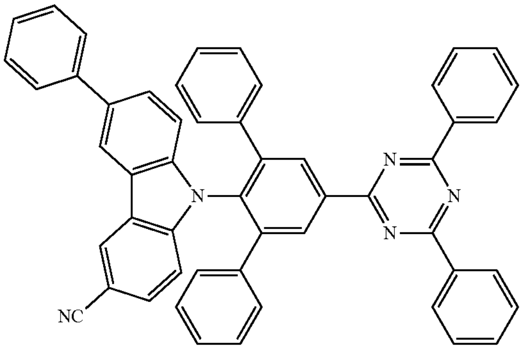
22
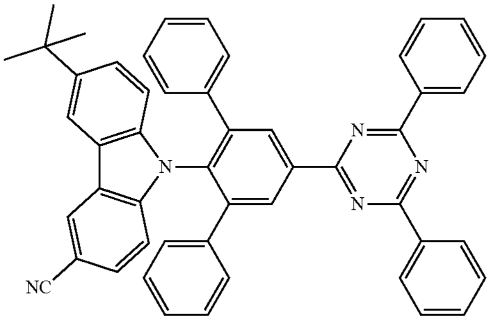

-continued
23
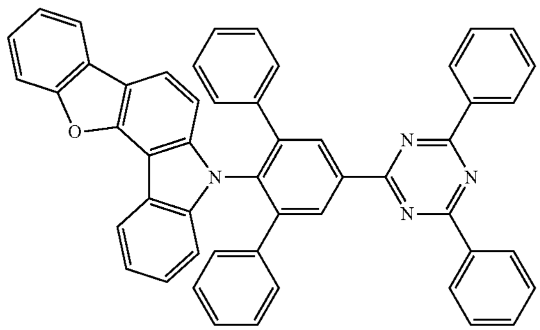
24
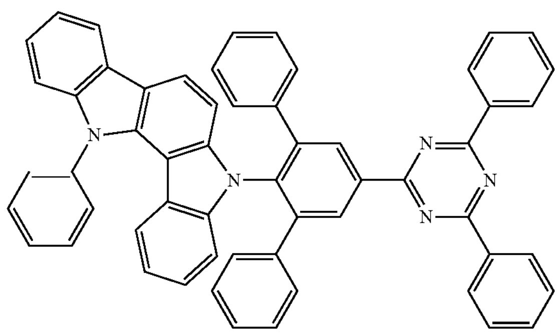
25
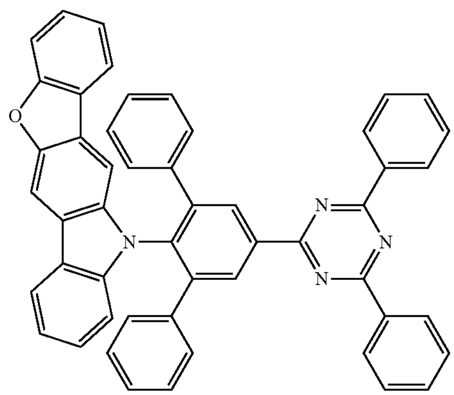
26
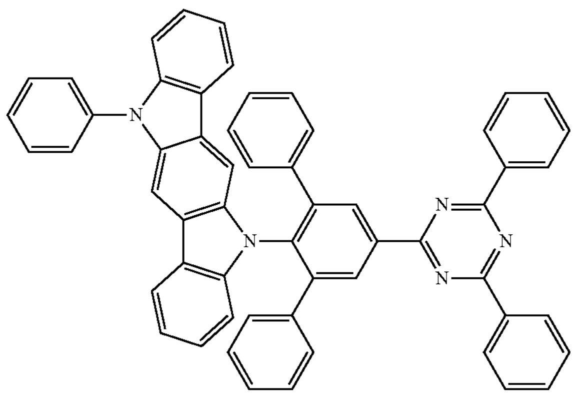
-continued
27
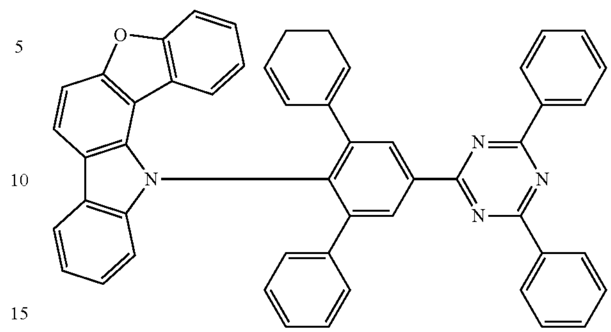
28
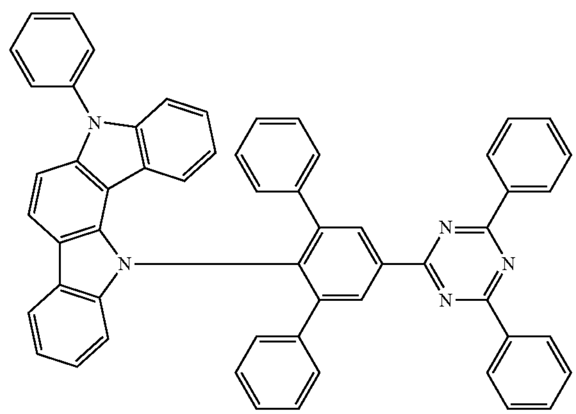
29
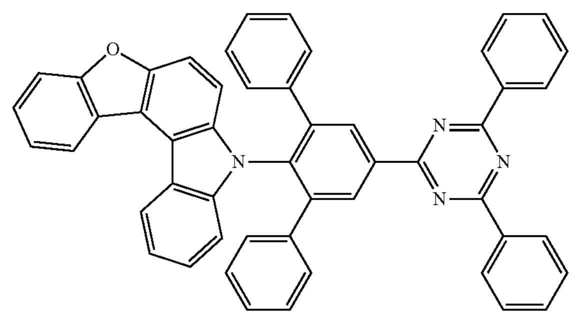
30
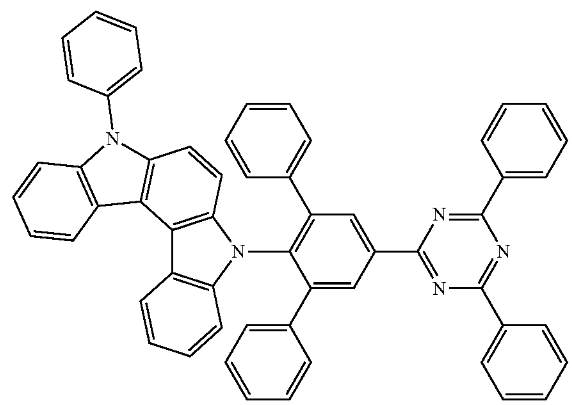

-continued
31
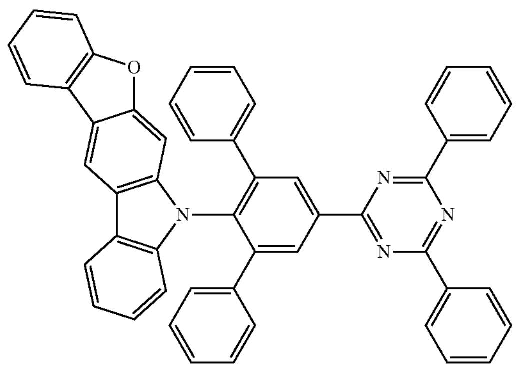
32
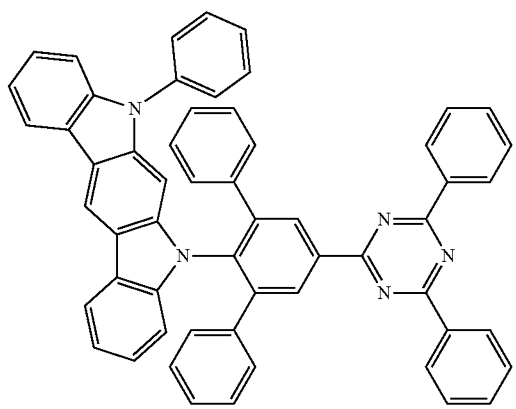
33
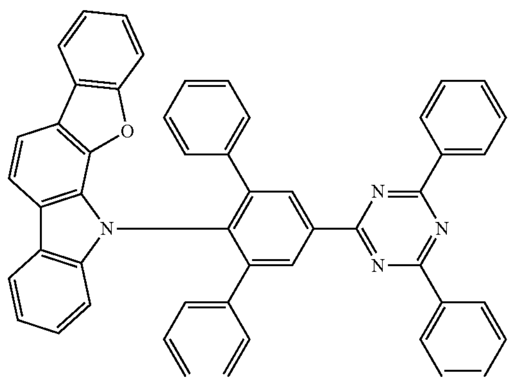
34
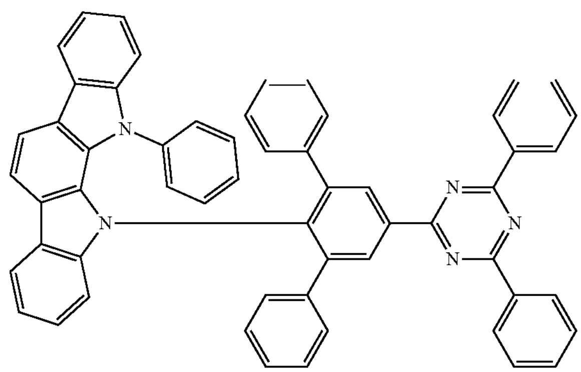
-continued
35
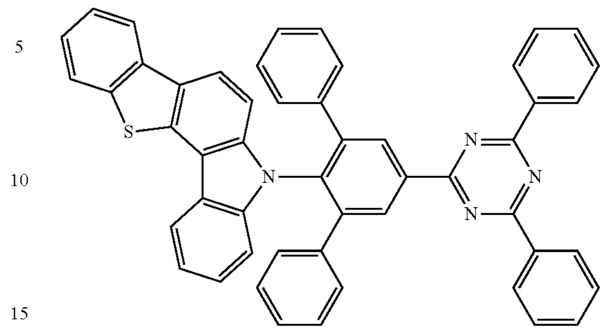
36
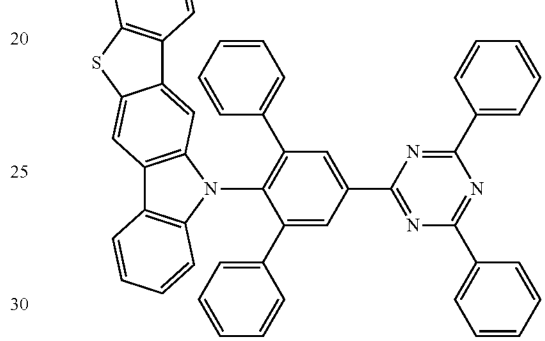
37
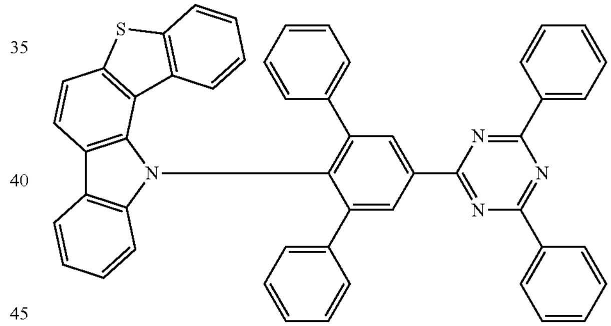
38
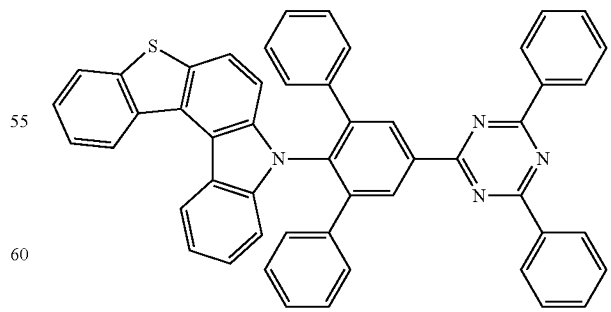

-continued
39
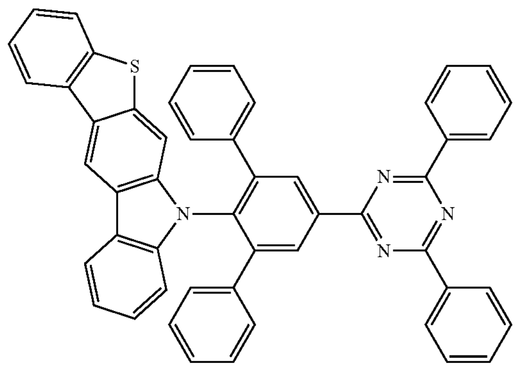
40
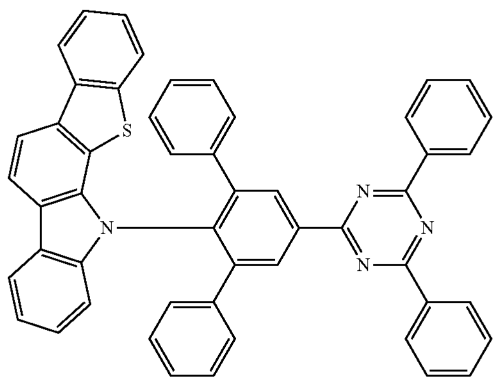
41
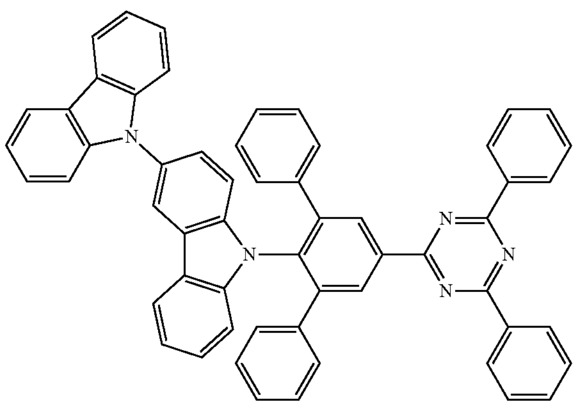
-continued
42
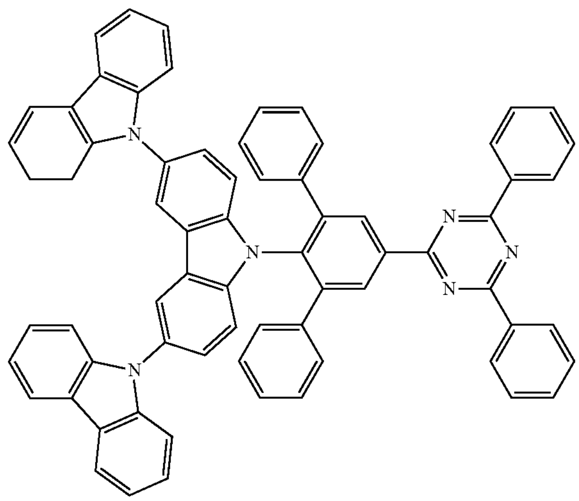
43
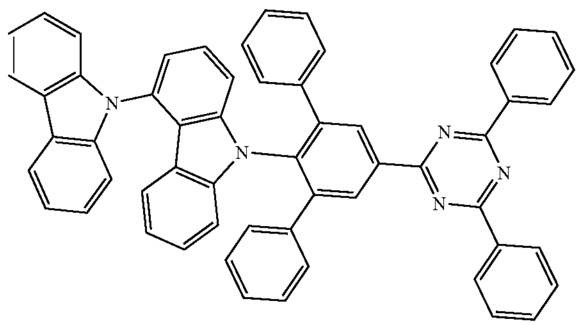
44
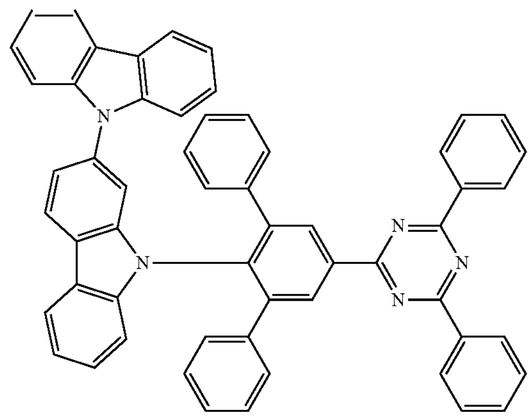

-continued
45
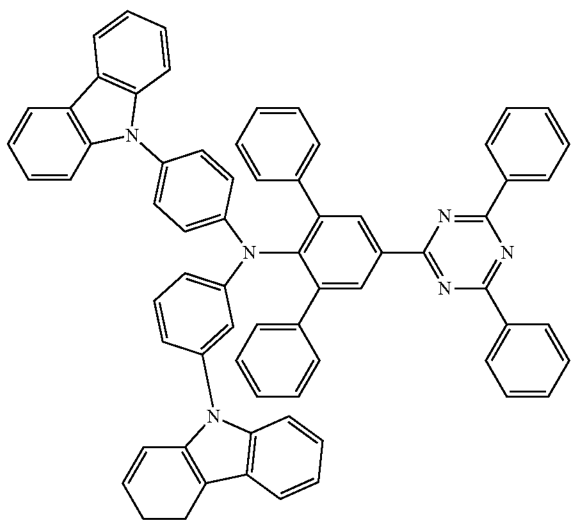
46
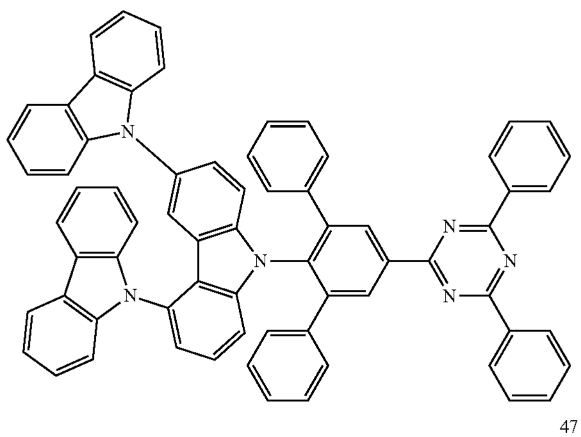
47
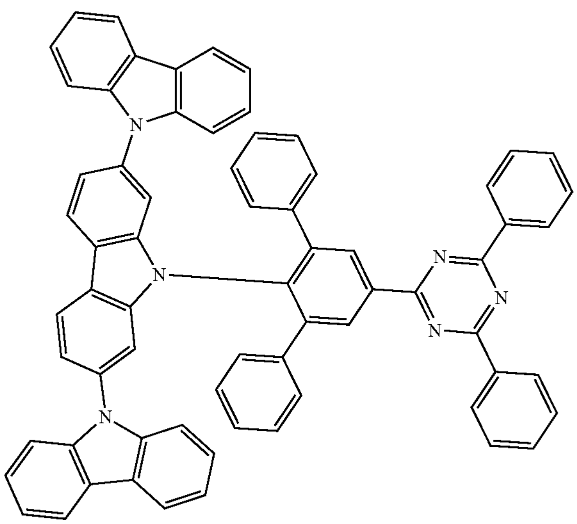
-continued
48
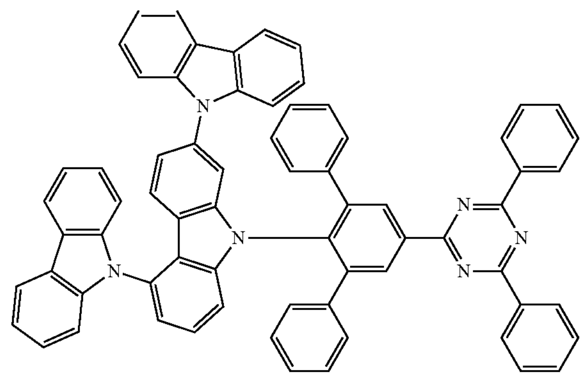
49
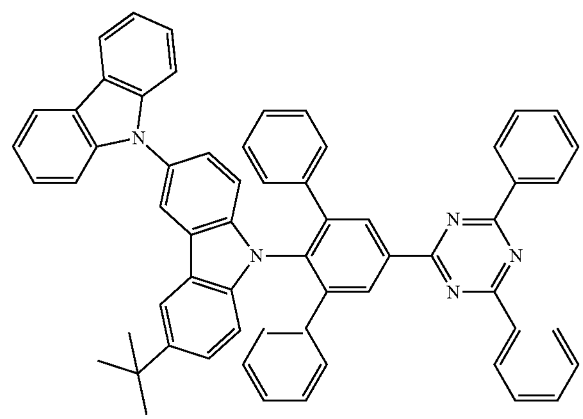
50
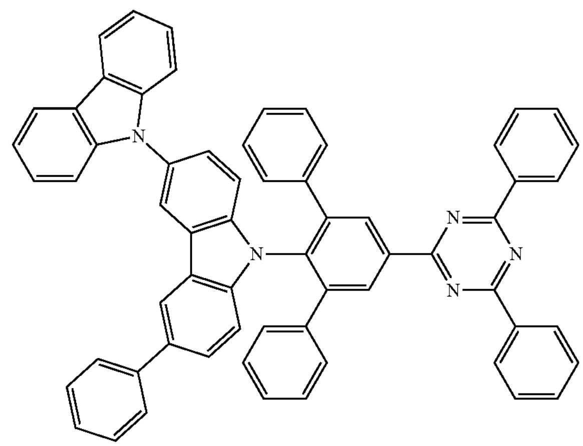

-continued
51
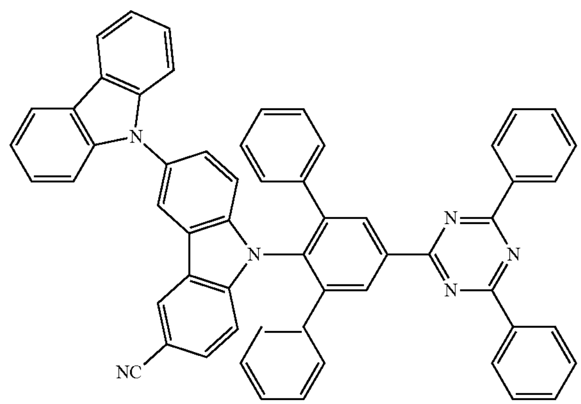
52
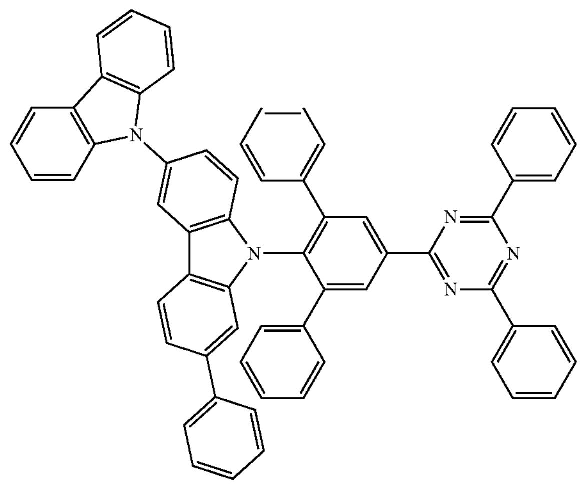
53
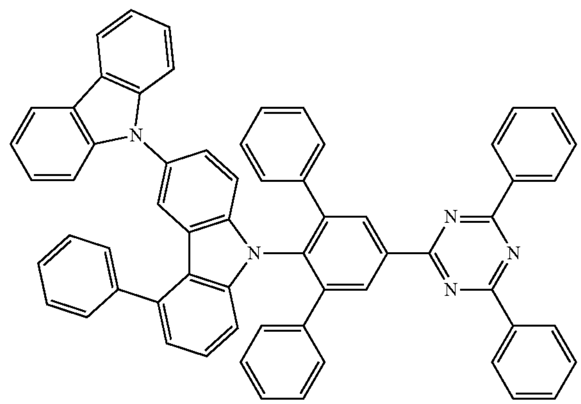
-continued
54
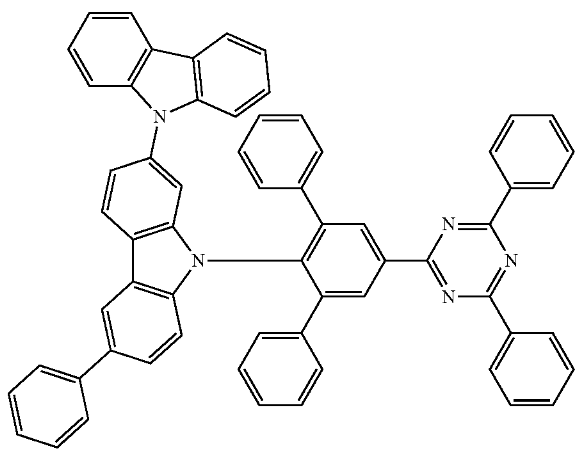
55
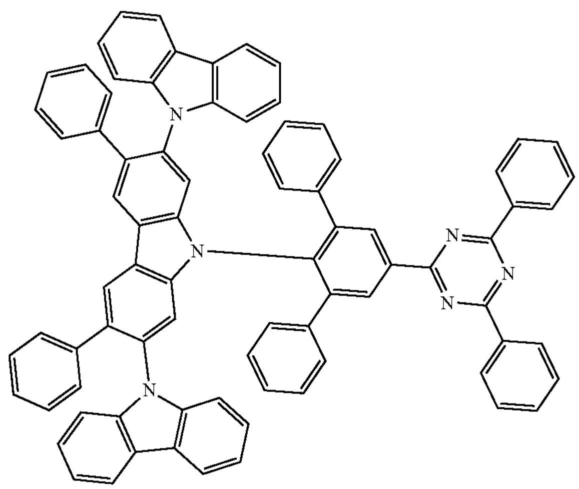
56
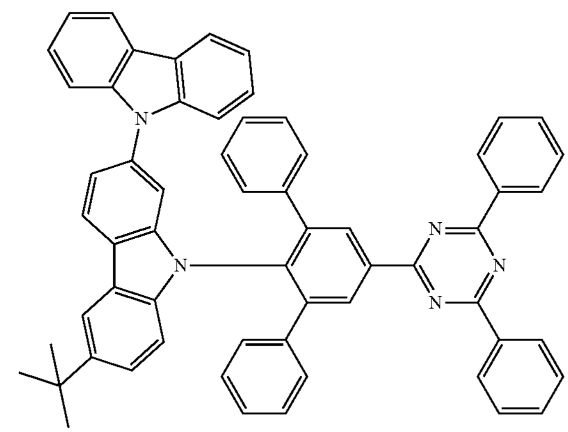

-continued
57
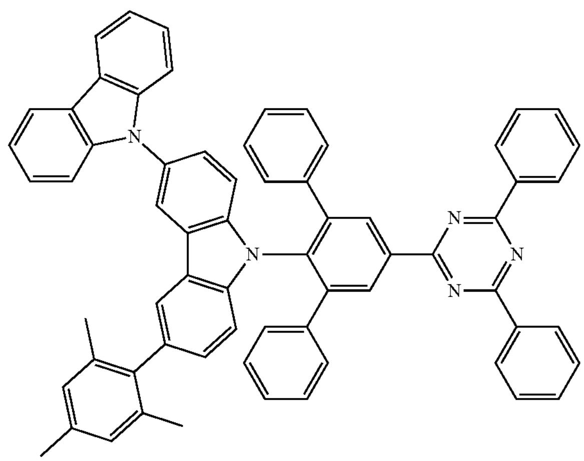
58
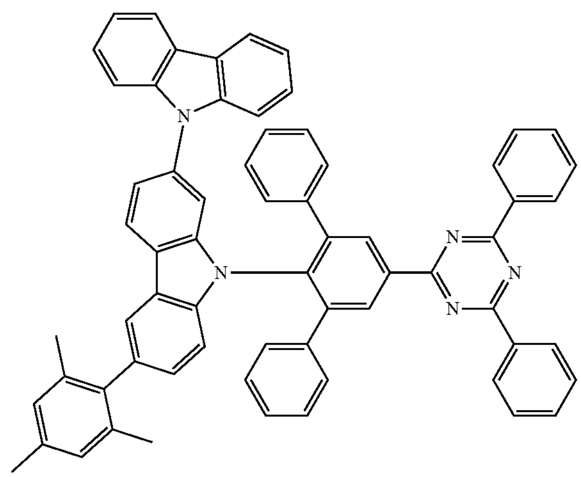
59
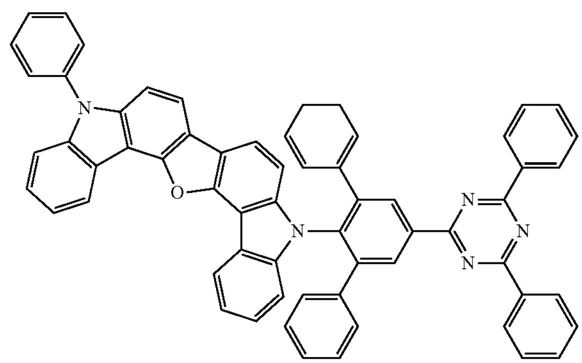
-continued
60
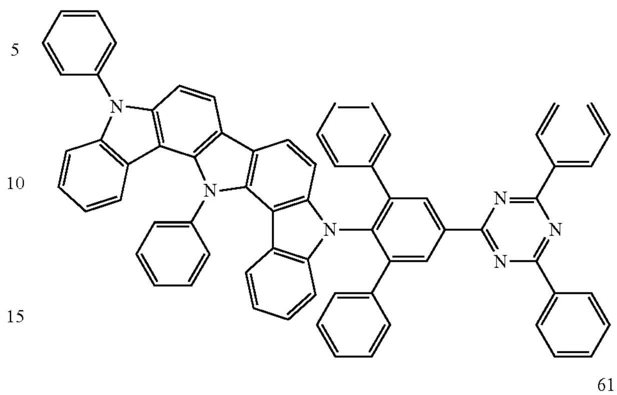
61
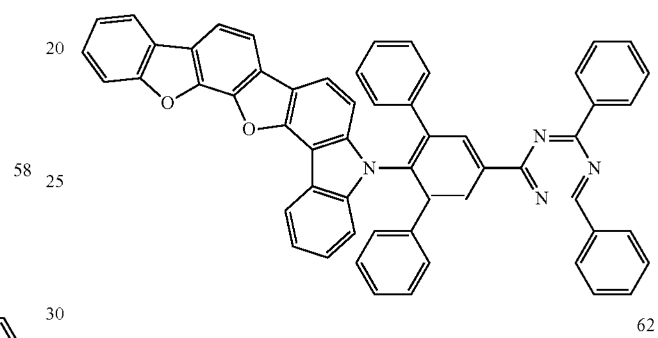
62
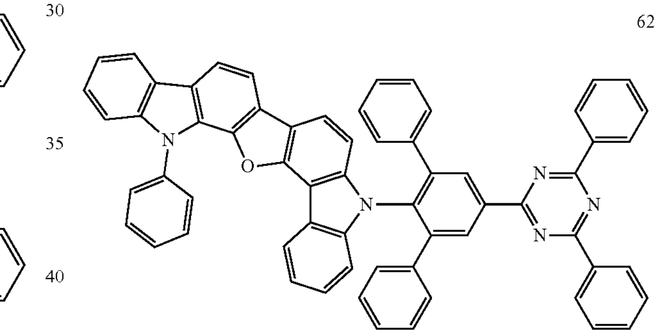
63
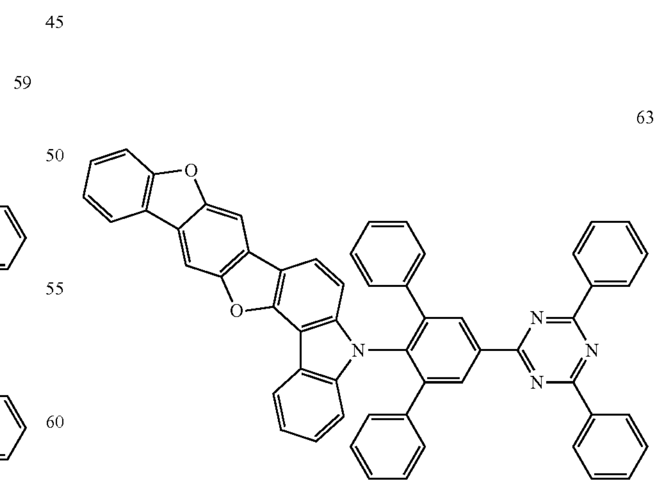

-continued
64
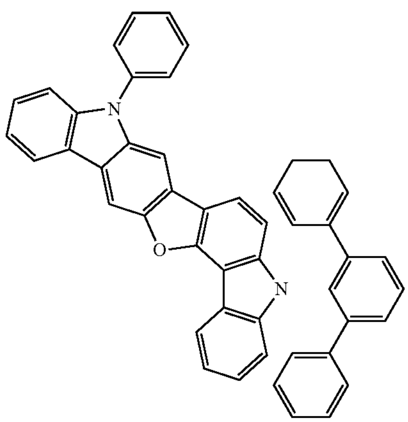
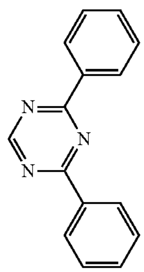
65
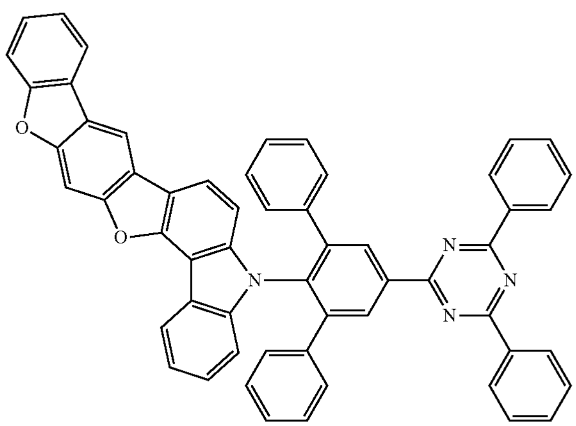
66
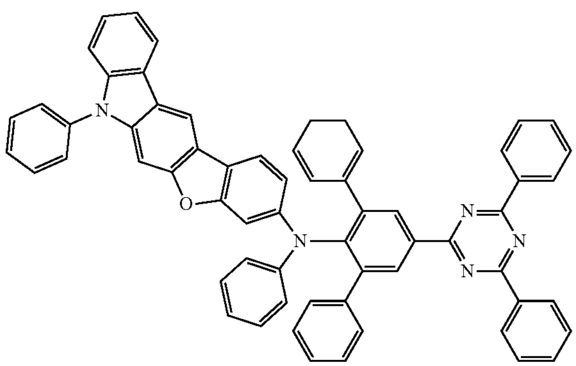
-continued
67
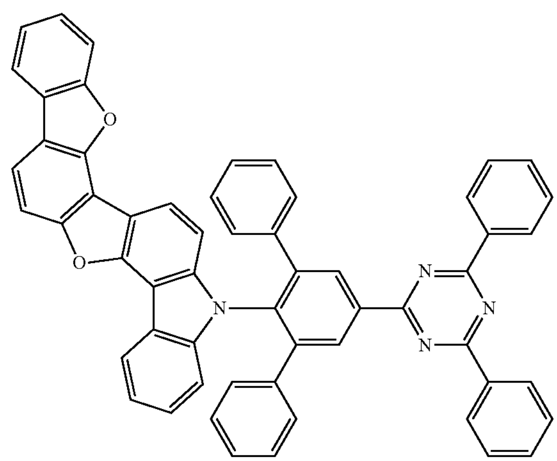
68
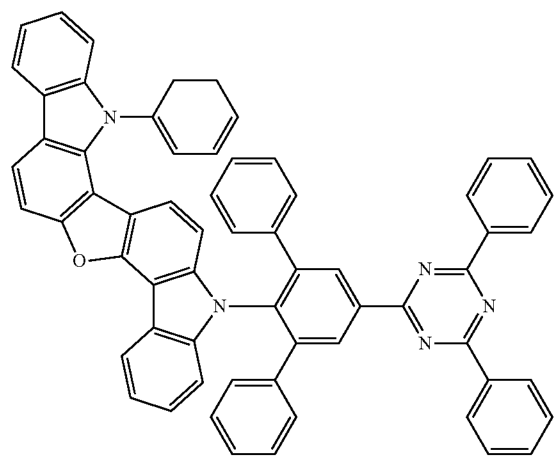
69
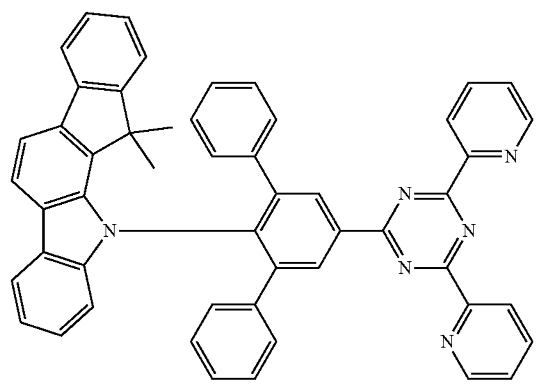

-continued
70
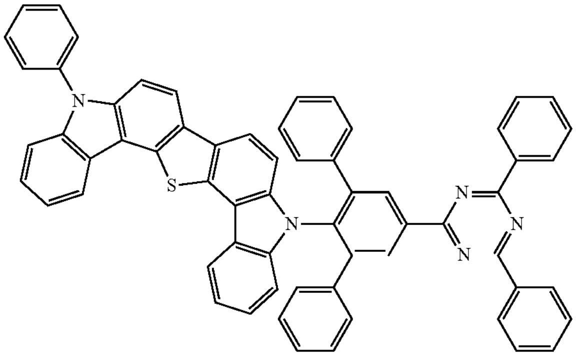
71
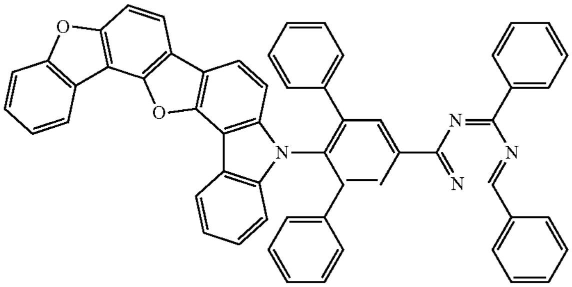
72
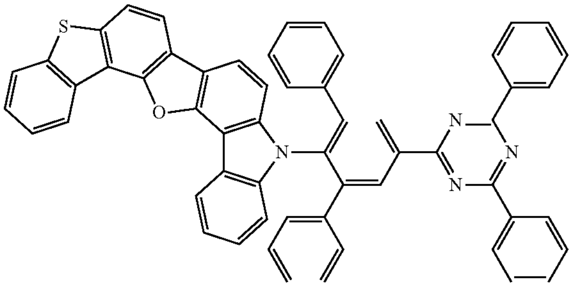
73
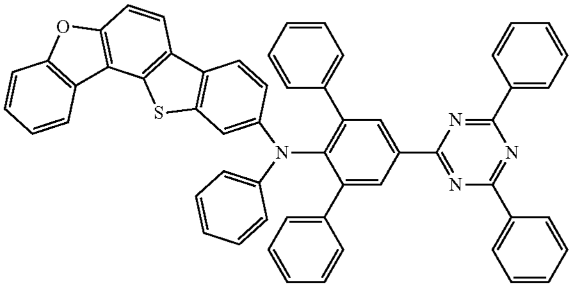
74
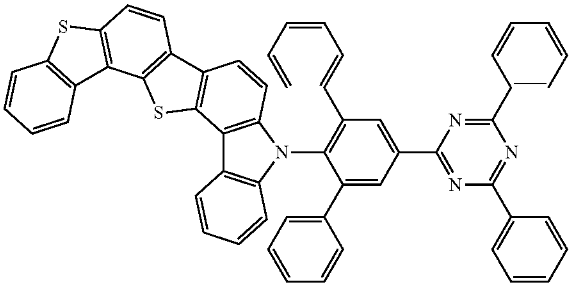
-continued
75
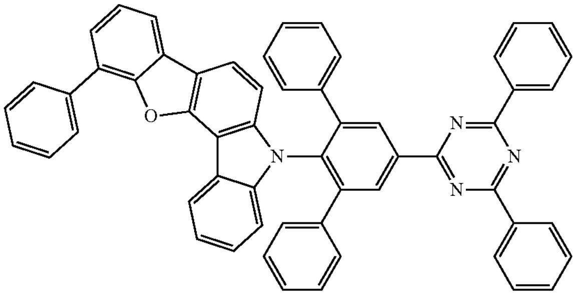
76
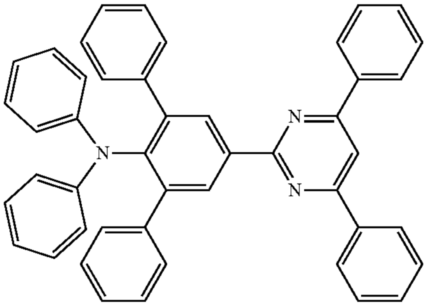
77
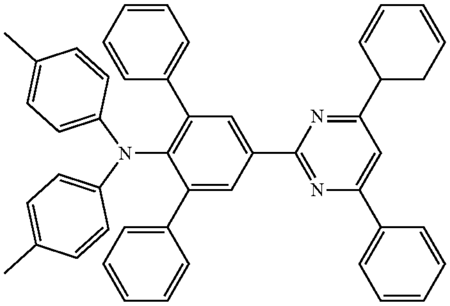
78
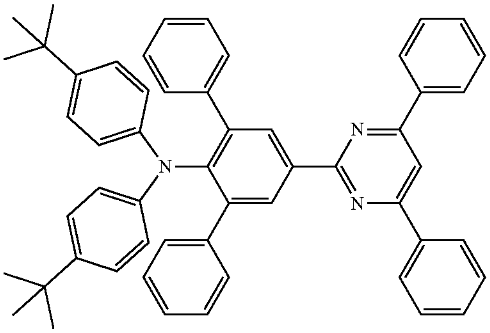

-continued
79
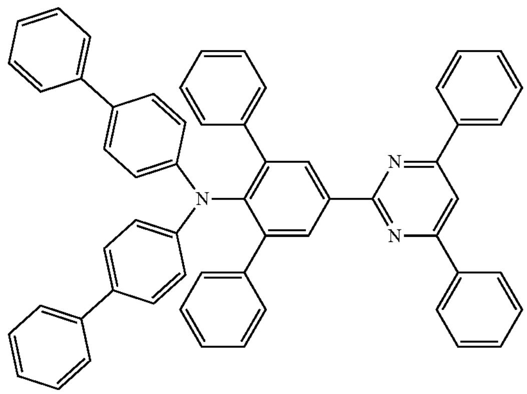
80
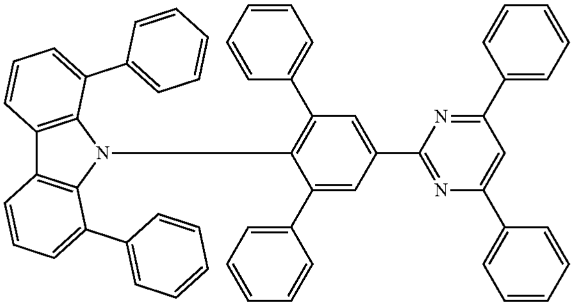
81
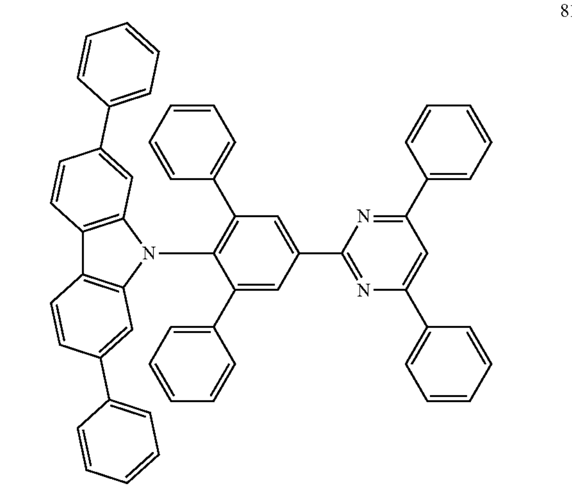
82
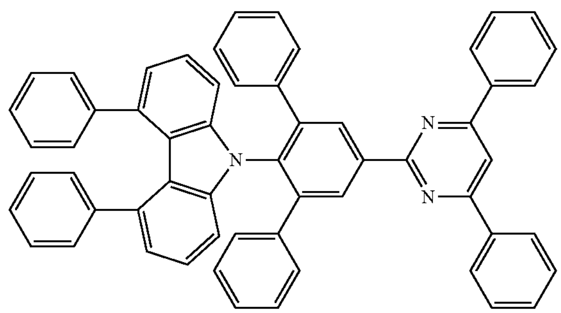
-continued
83
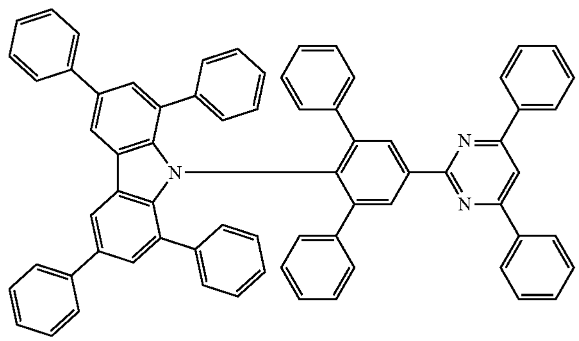
84
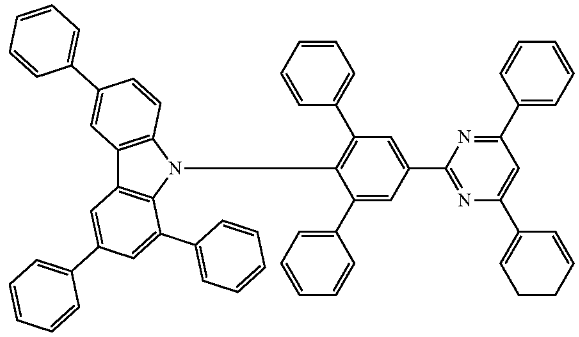
85
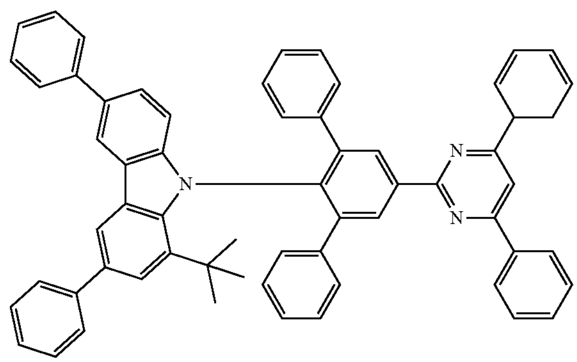
86
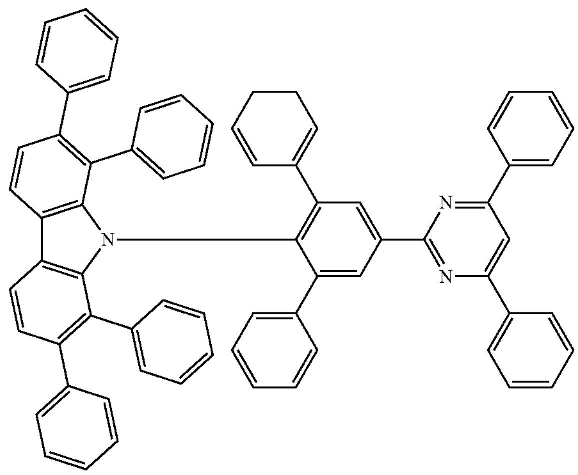

-continued
87
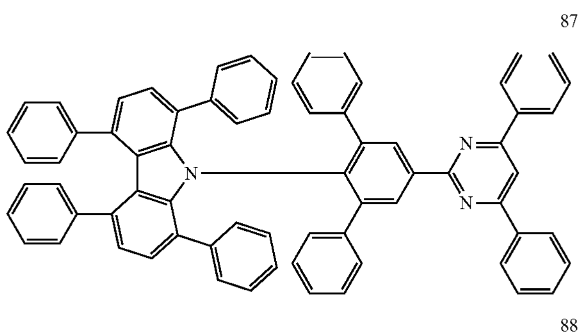
88
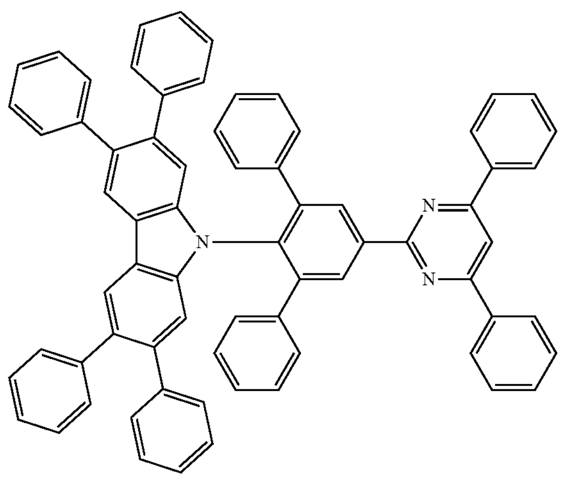
89
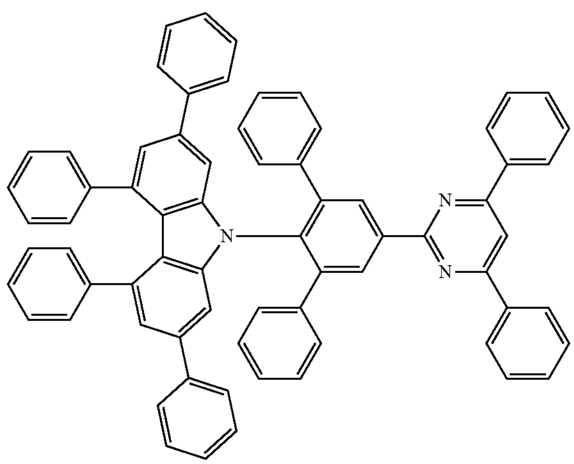
90
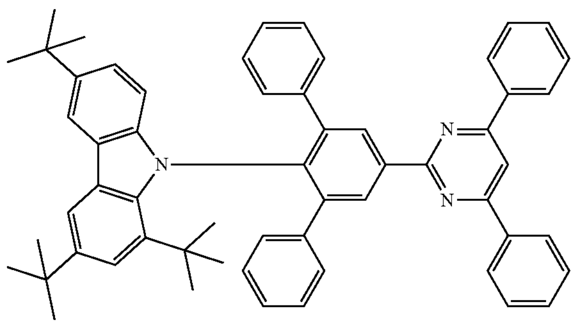
-continued
91
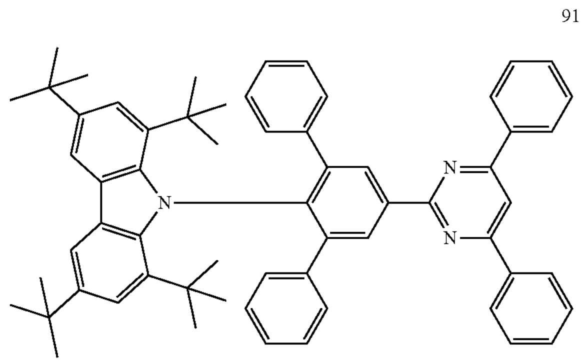
92
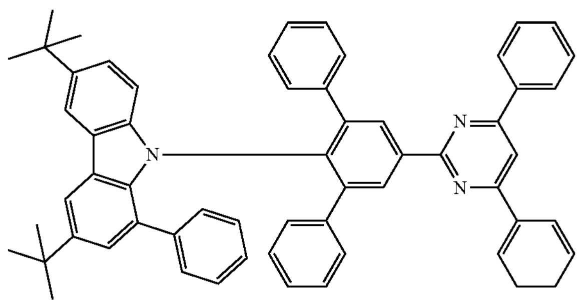
93
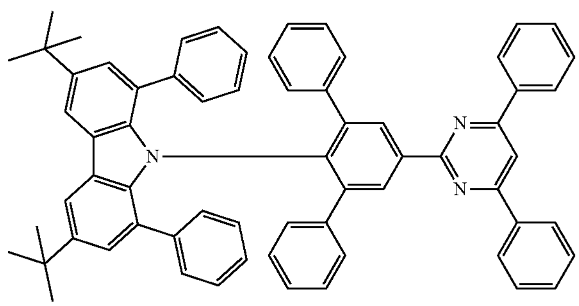
94
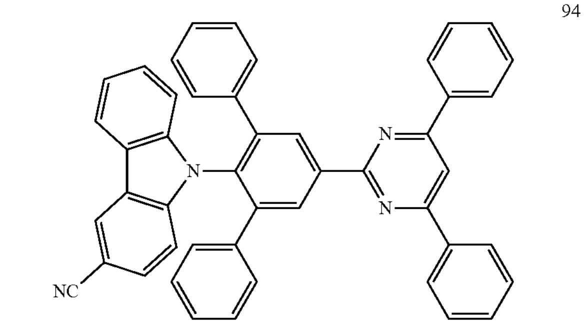
95
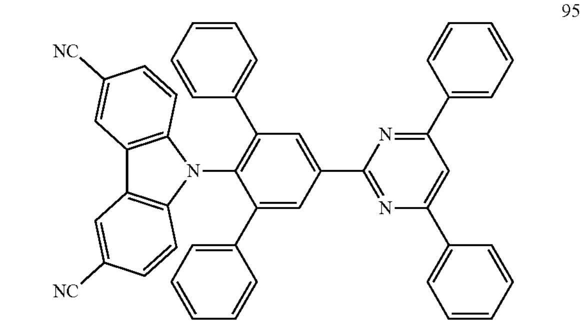

-continued
96
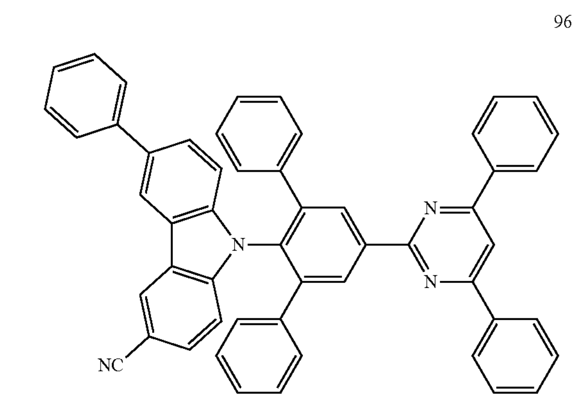
97
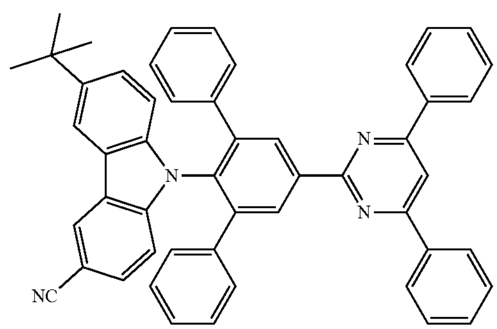
98
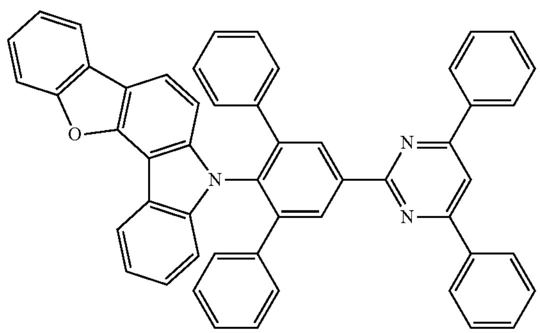
99
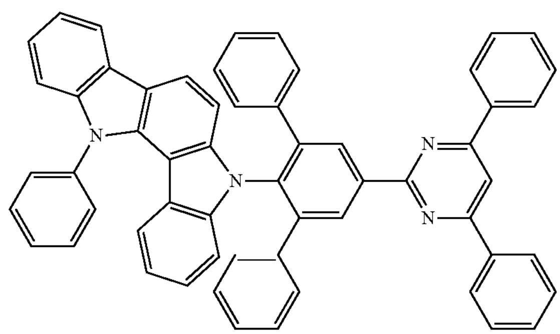
-continued
100
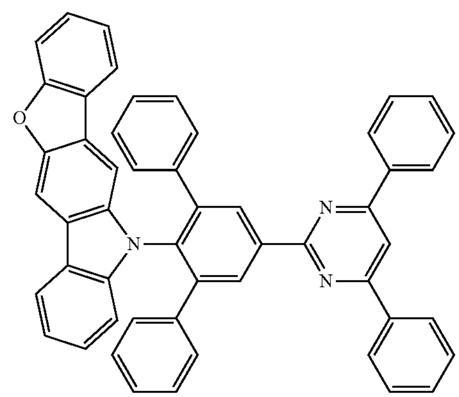
101
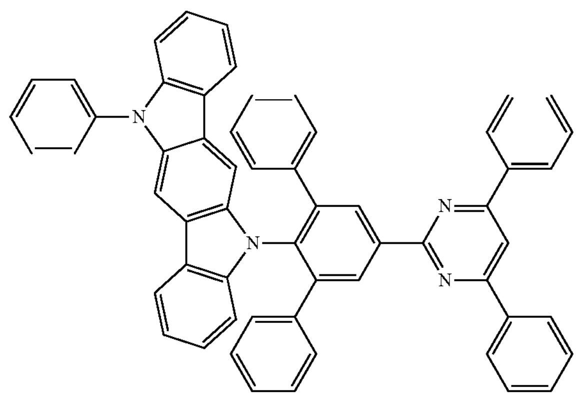
102
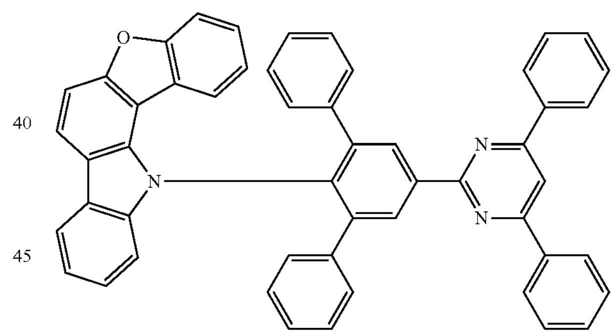
103
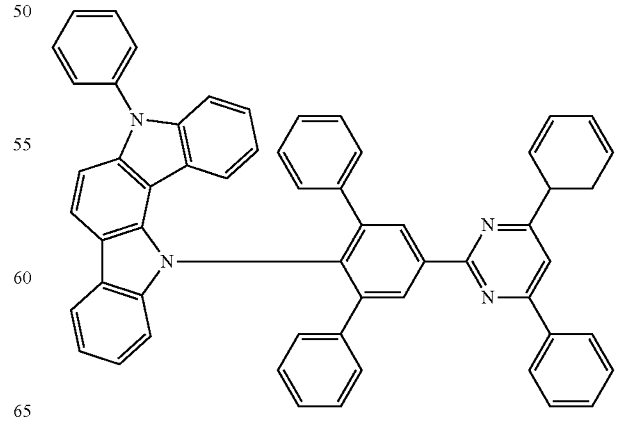

104
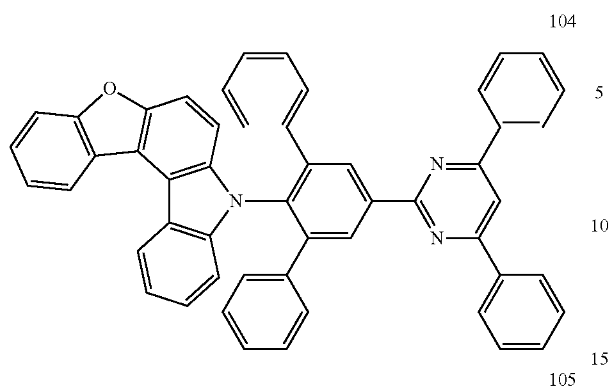
105
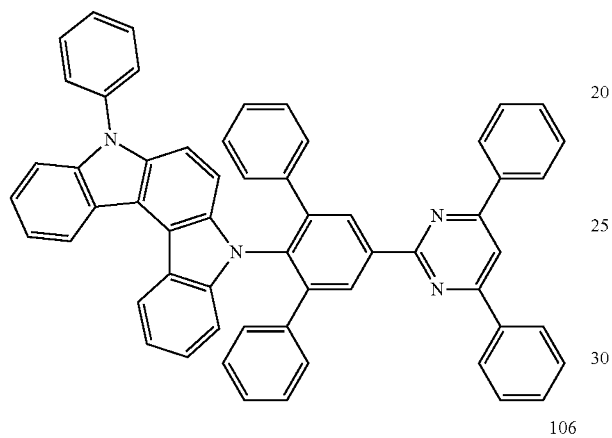
106
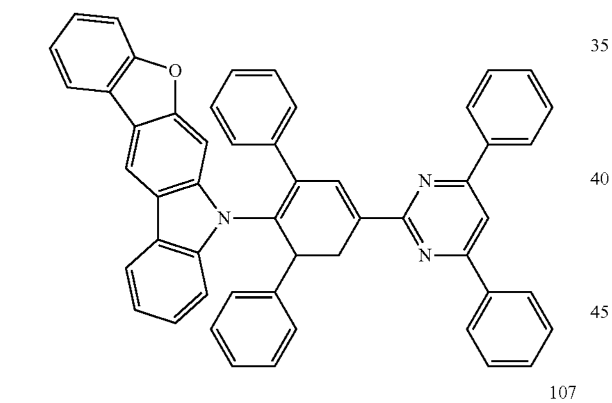
107
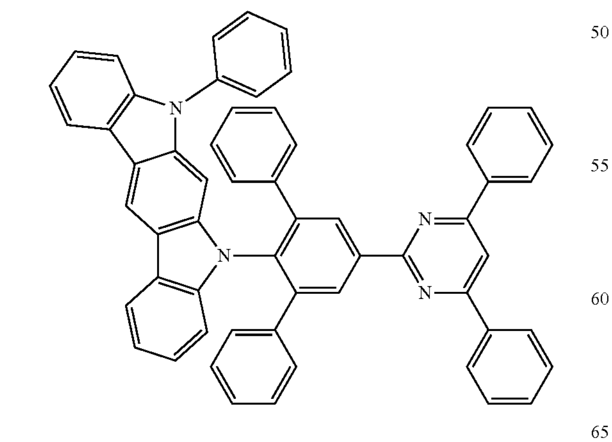
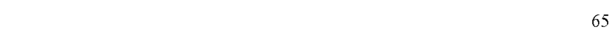
108
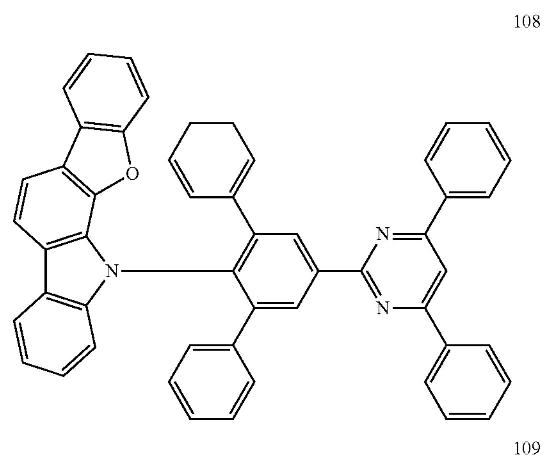
109
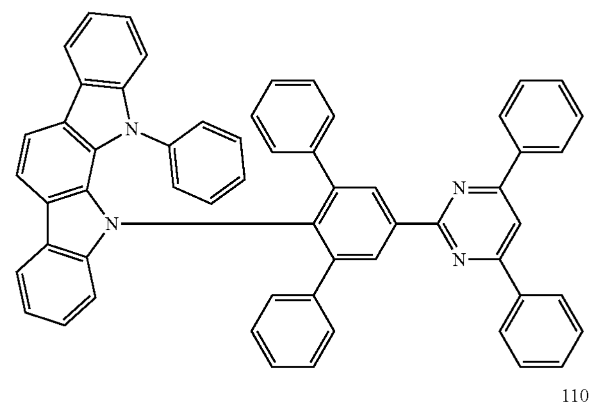
110
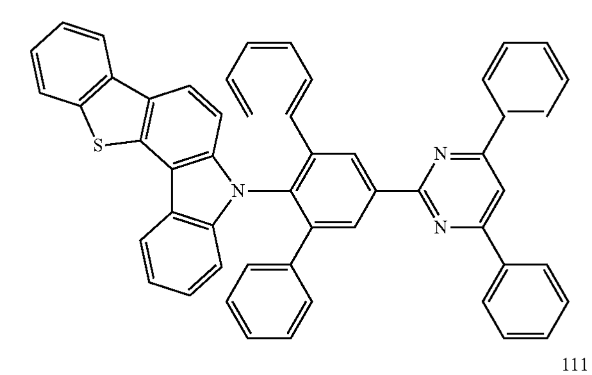
111
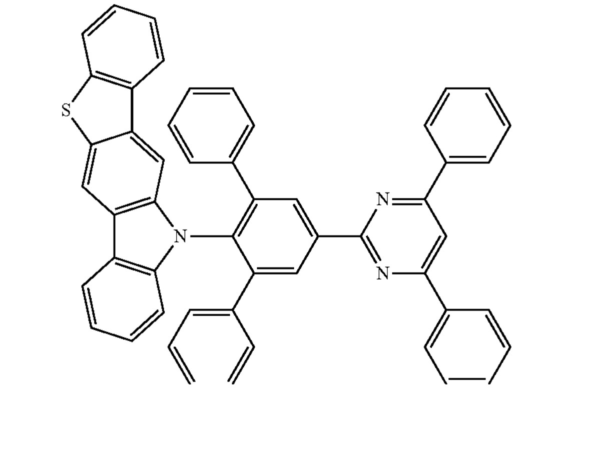

-continued
112
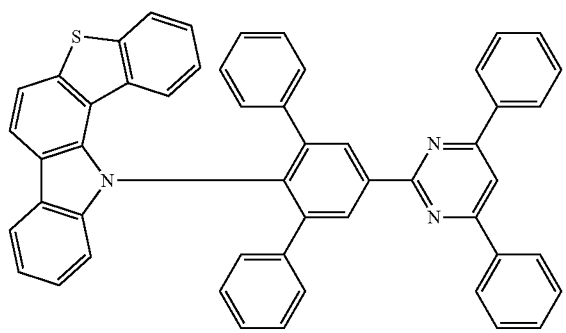
113
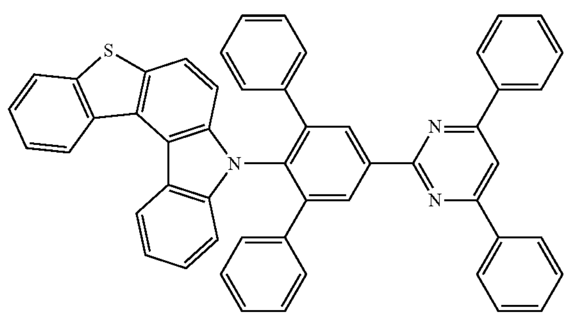
114
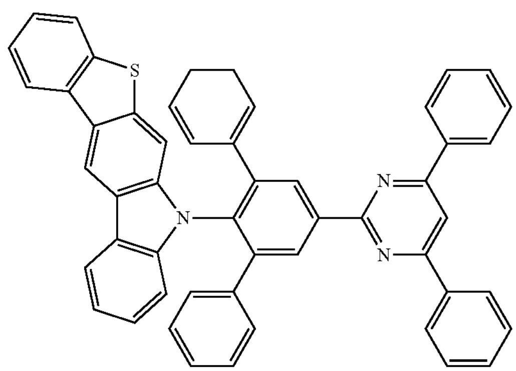
115
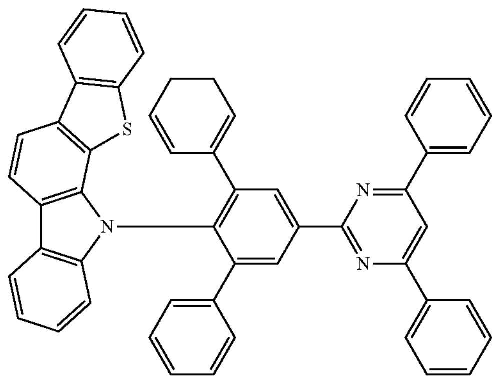
-continued
116
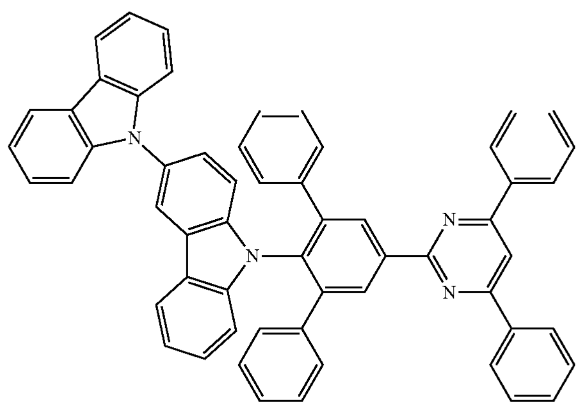
117
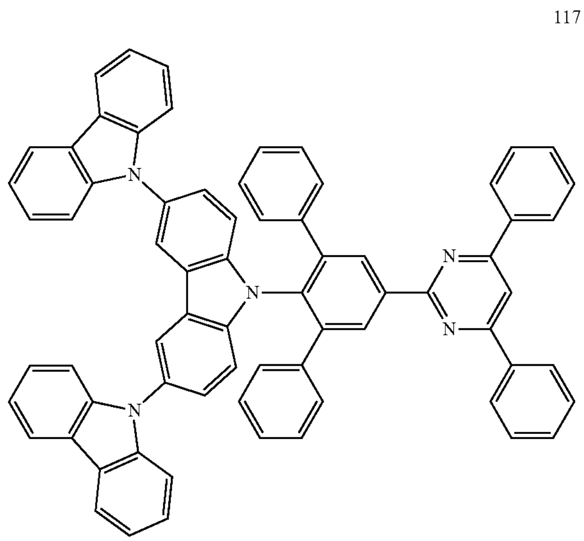
118
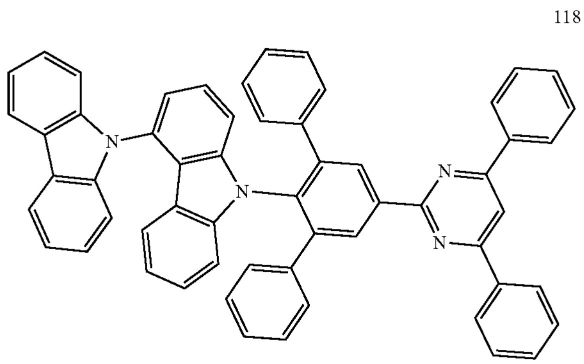

-continued
119
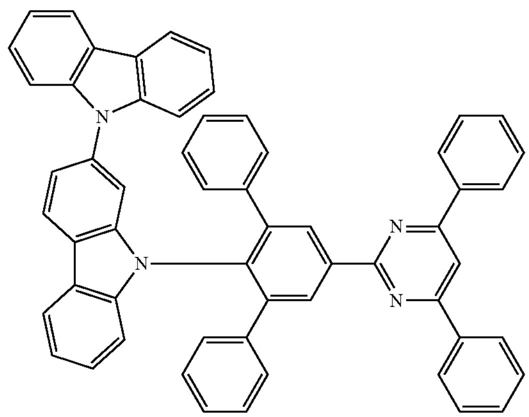
120
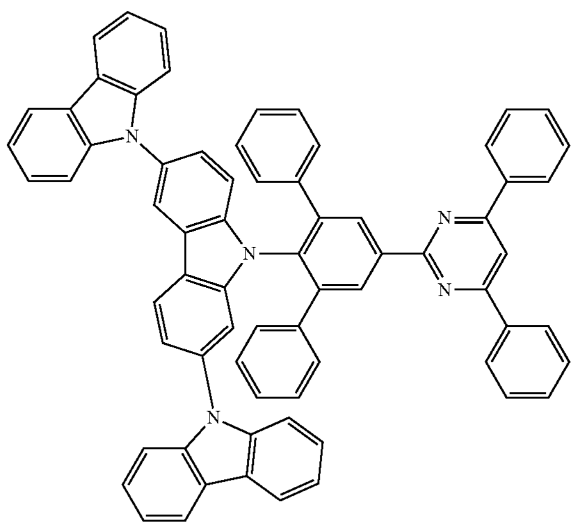
121
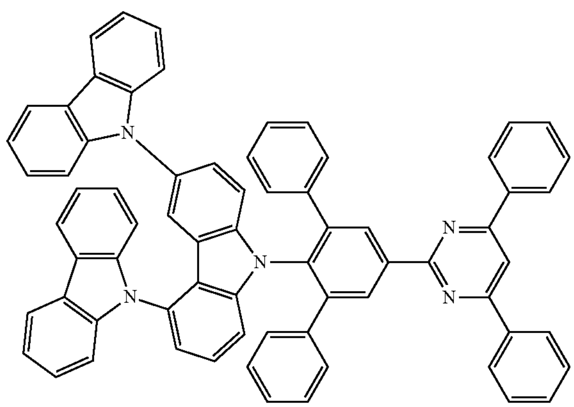
-continued
122
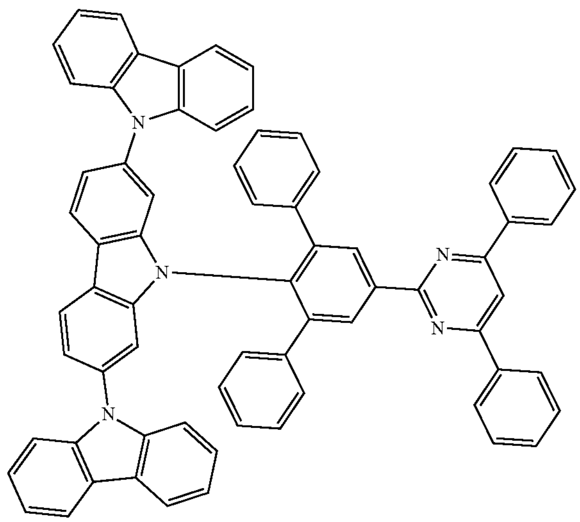
123
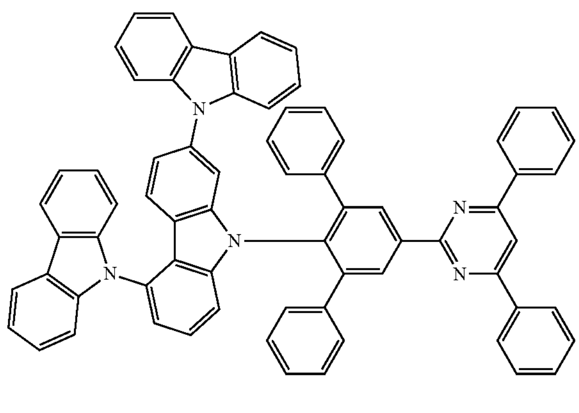
124
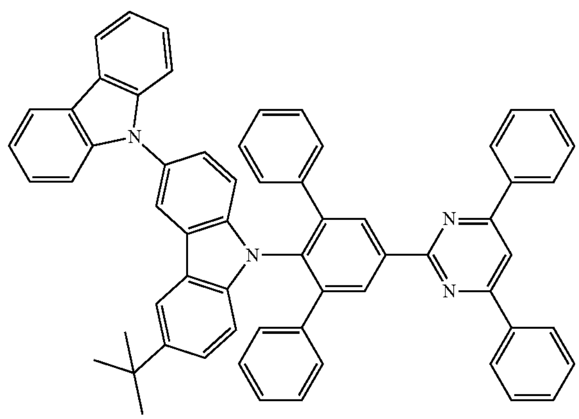

125
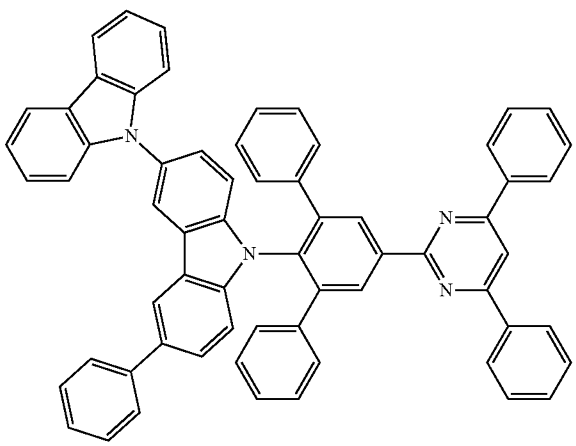
126
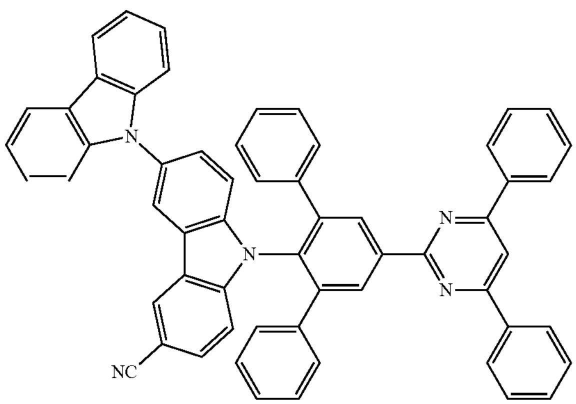
127
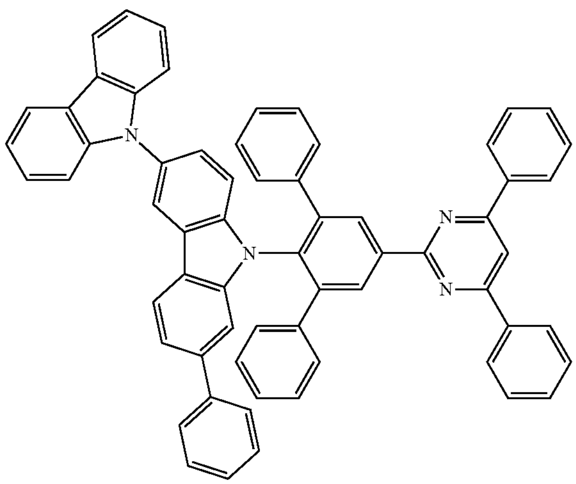
128
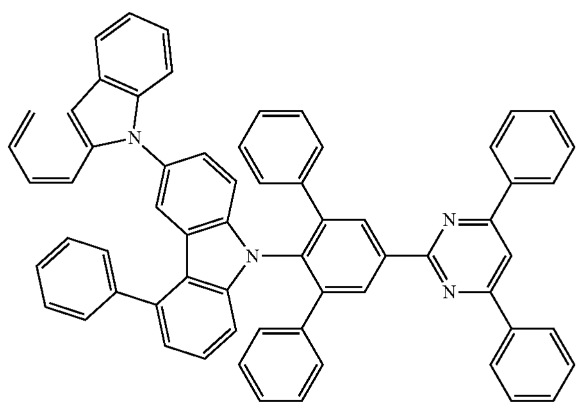
129
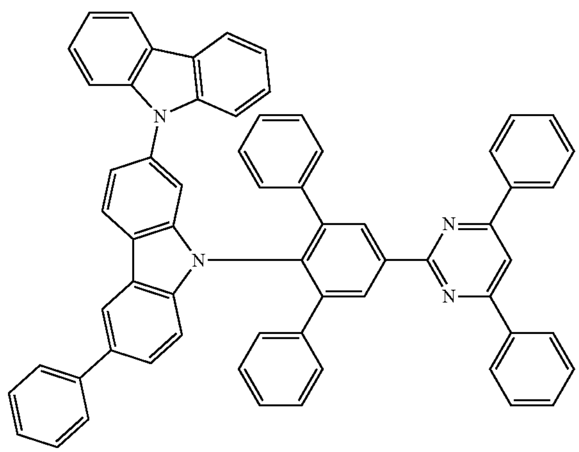
130
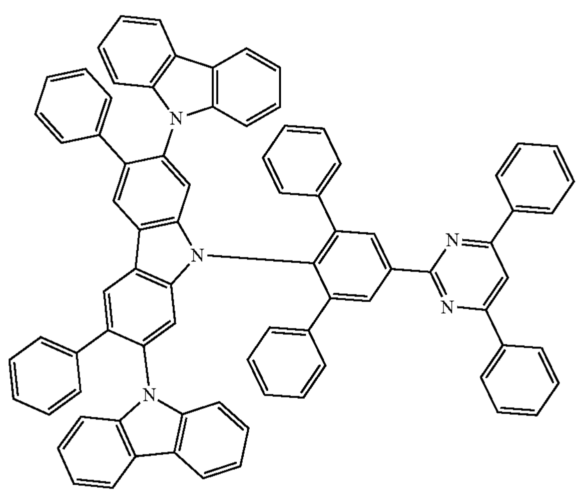

-continued
131
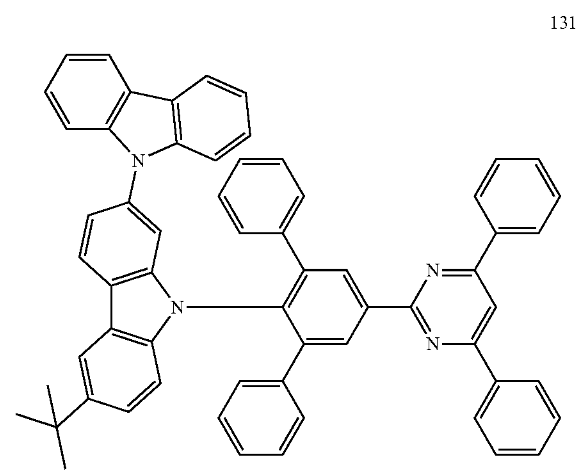
132
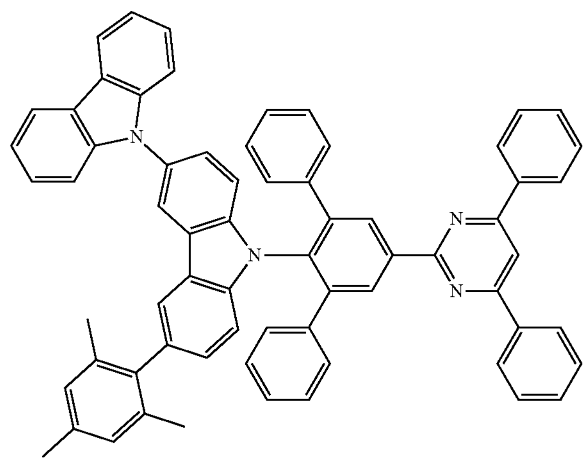
133
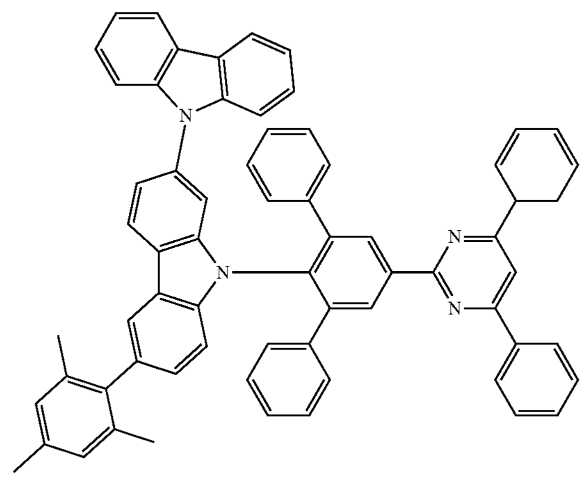
-continued
134
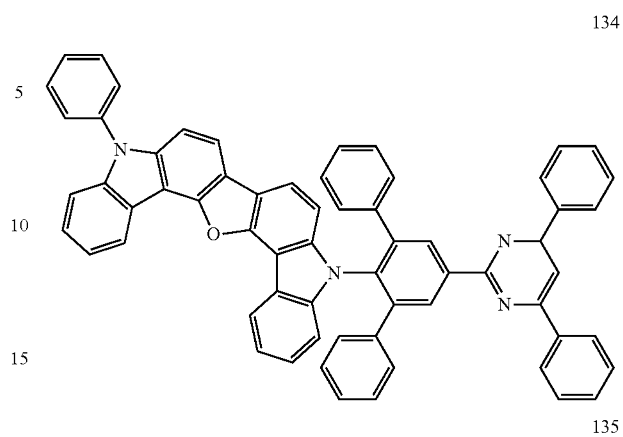
135
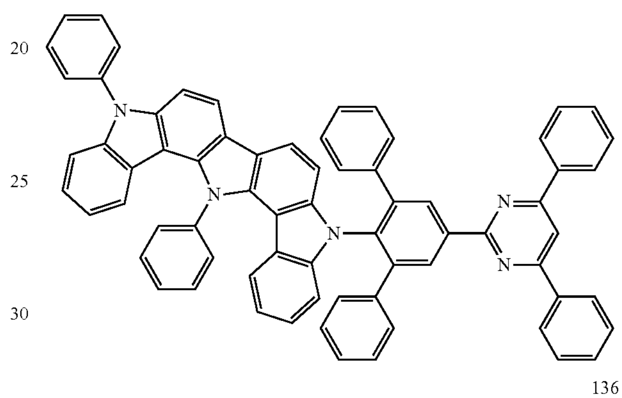
136
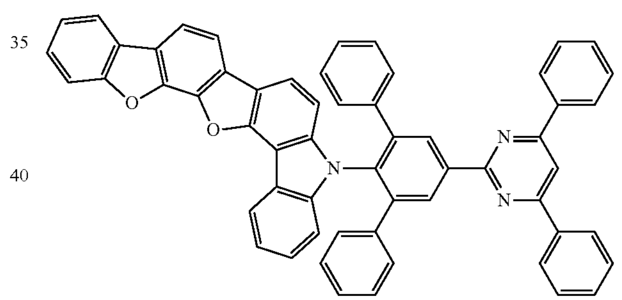
137
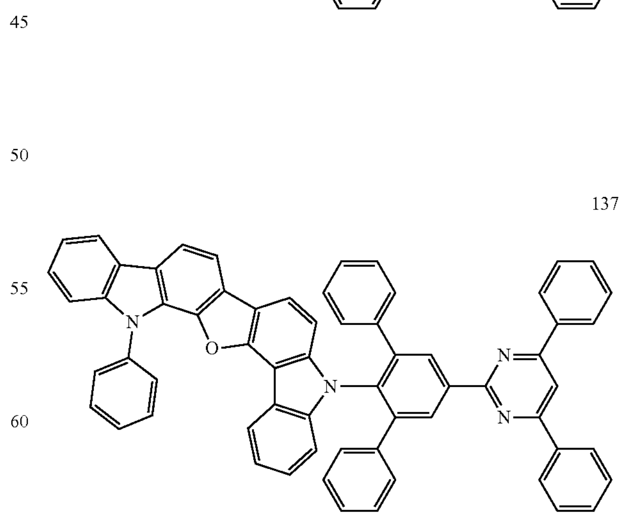

-continued
138
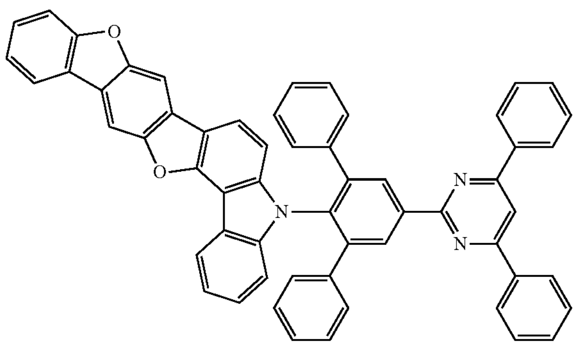
139
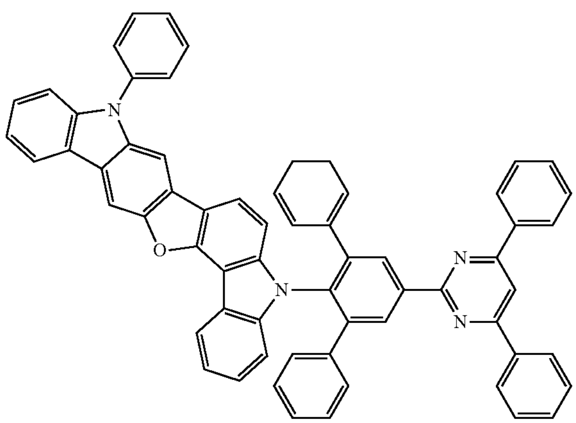
140
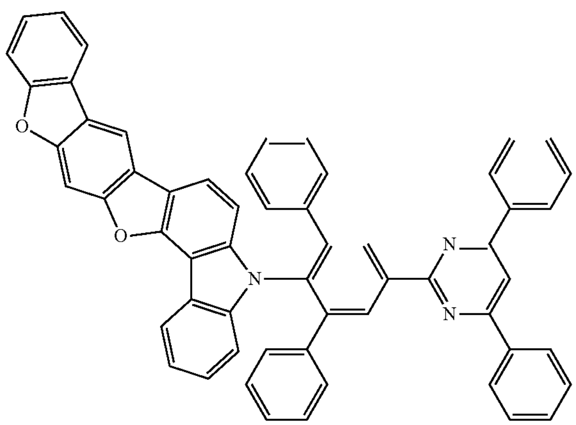
141
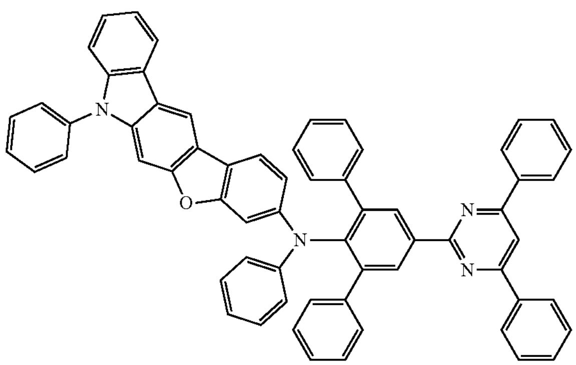
-continued
142
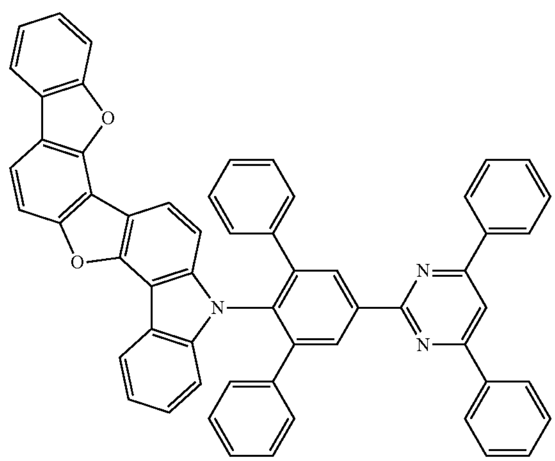
143
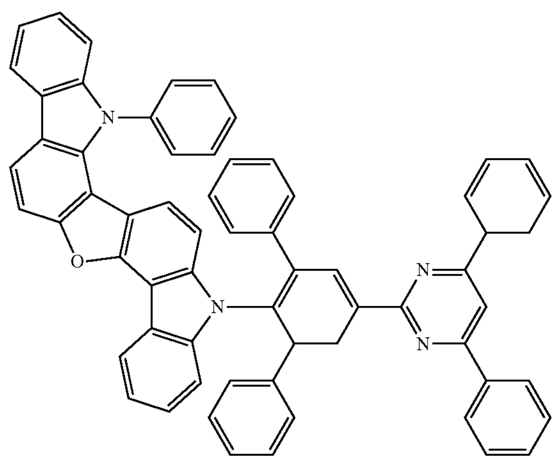
144
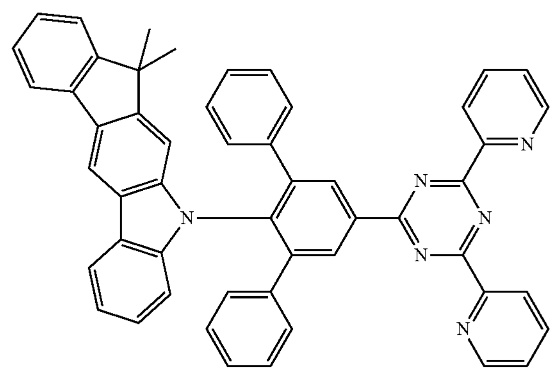

-continued
145
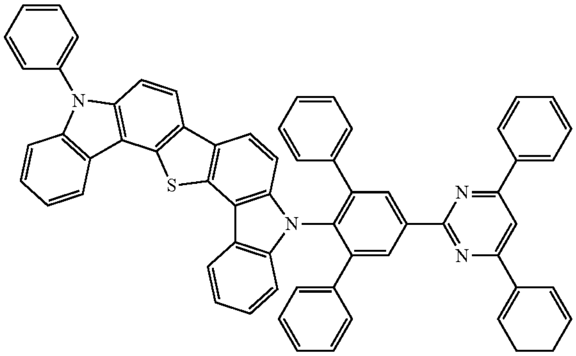
146
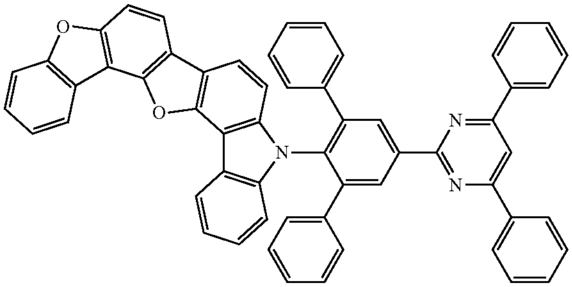
147
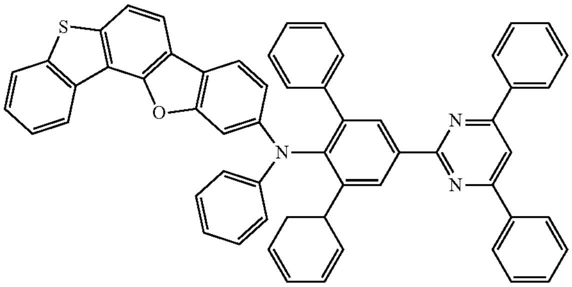
148
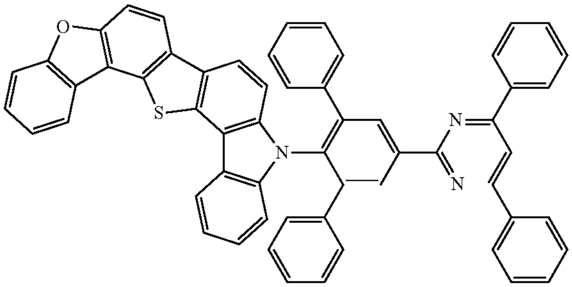
149
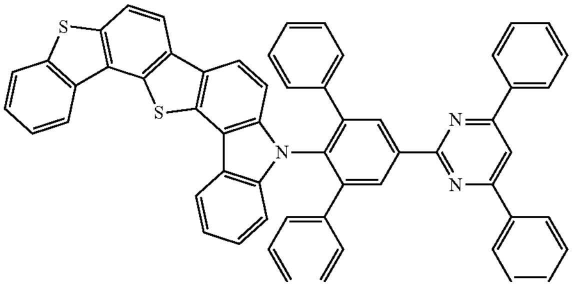
-continued
150
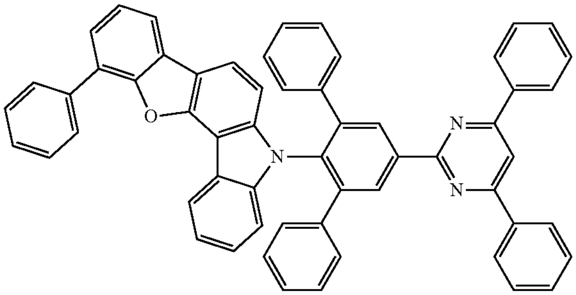
151
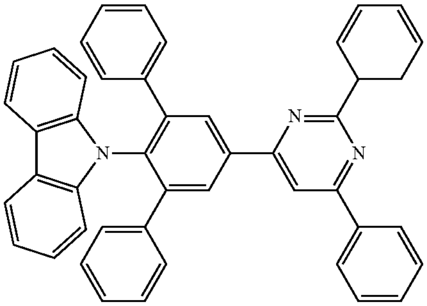
152
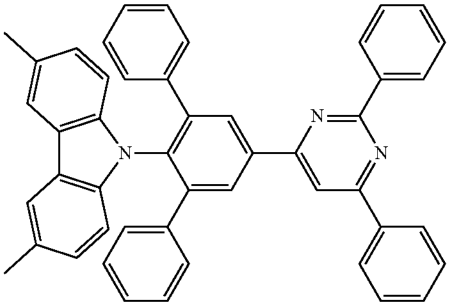
153
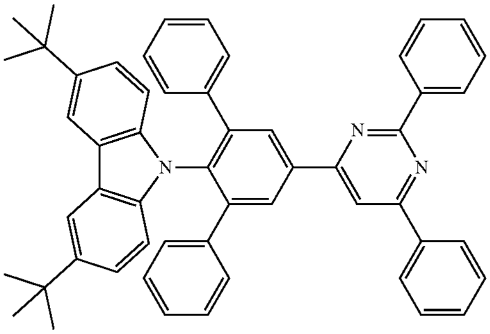

-continued
154
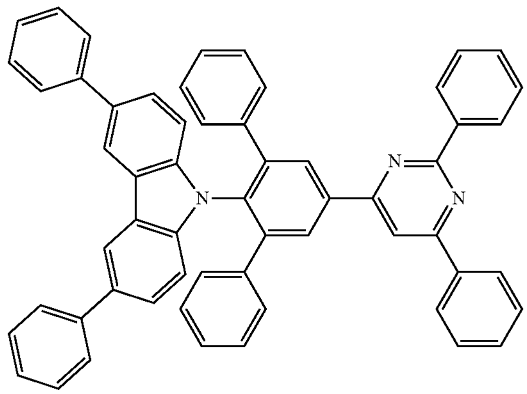
155
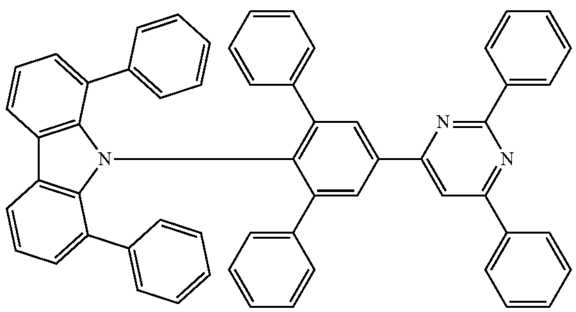
156
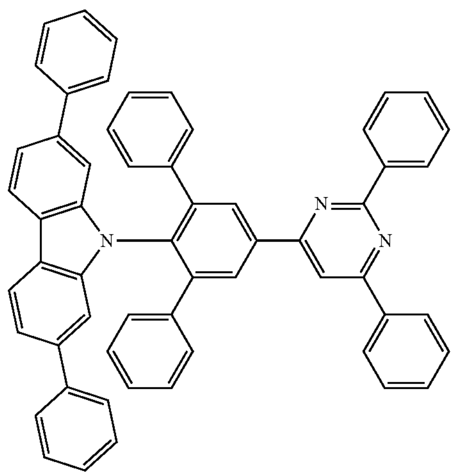
157
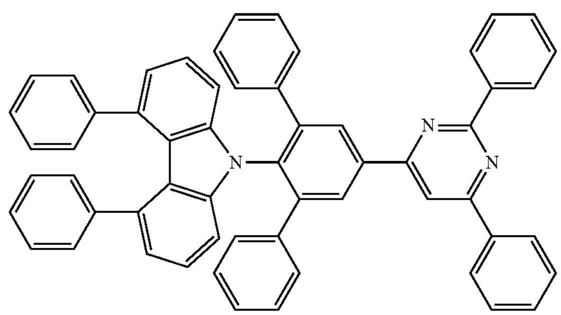
-continued
158
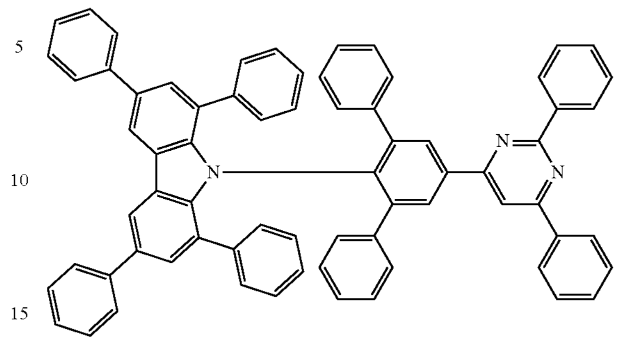
159
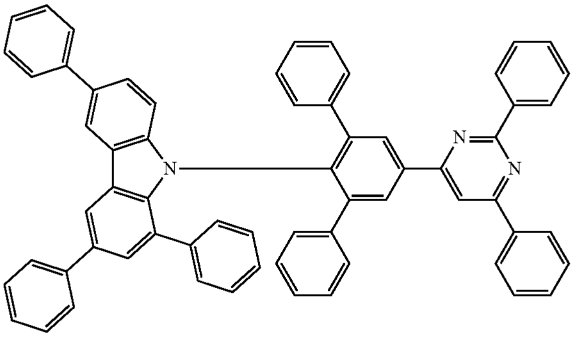
160
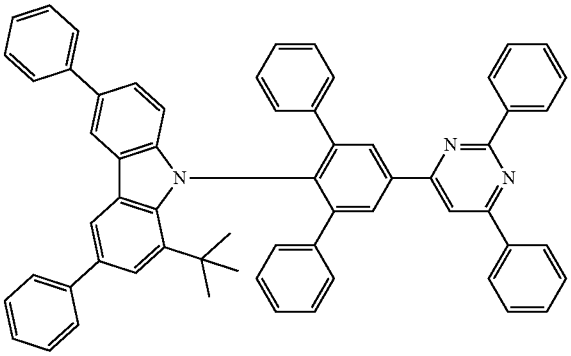
161
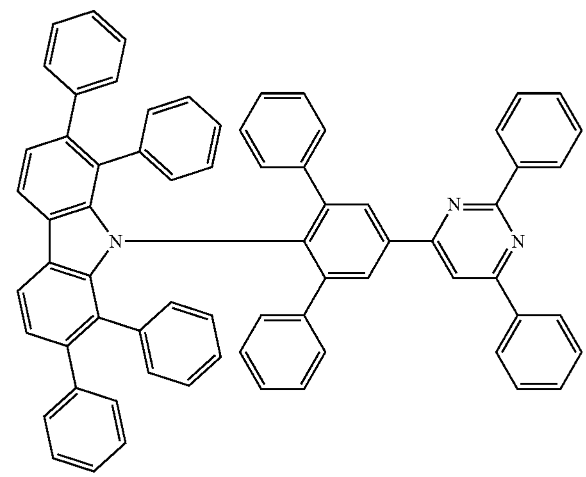

-continued
162
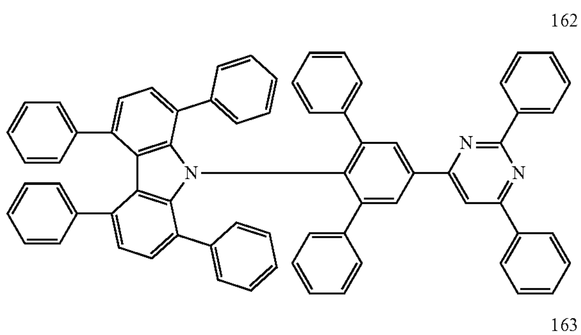
163
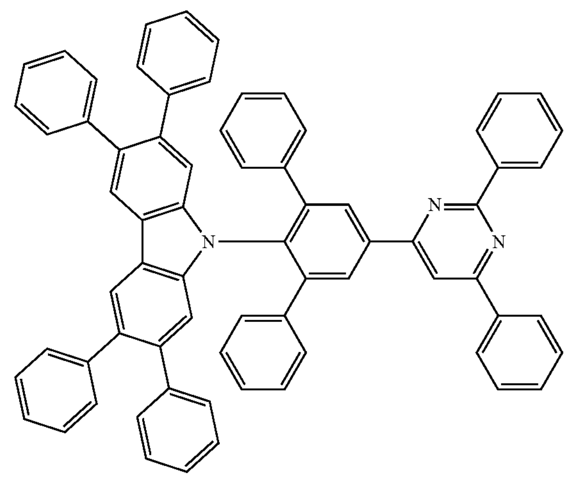
164
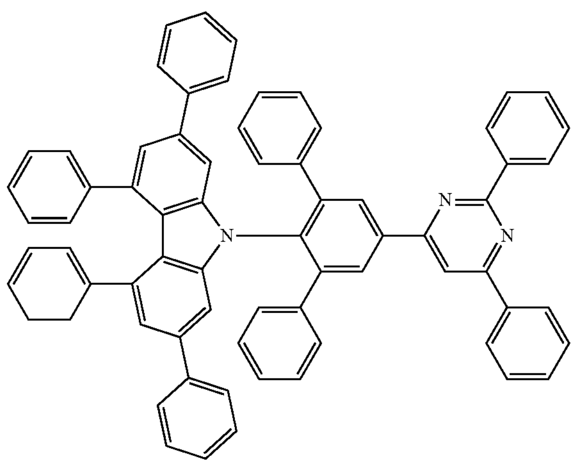
165
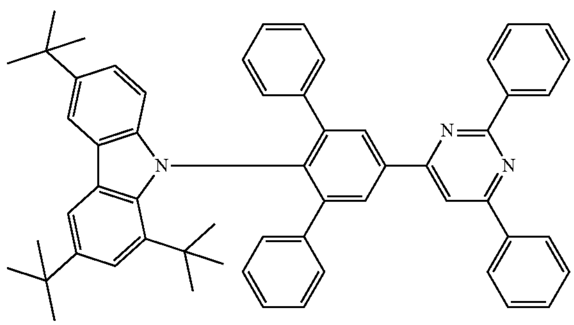
-continued
166
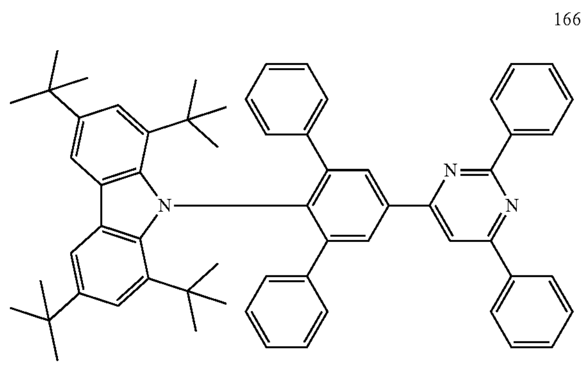
167
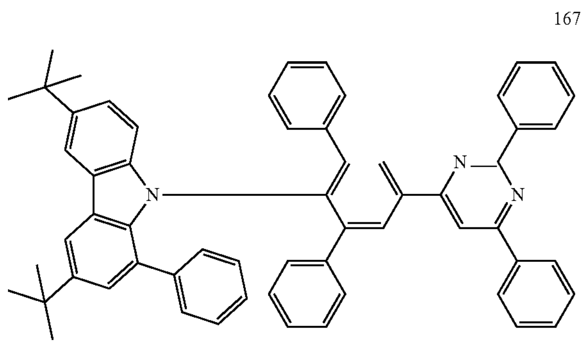
168
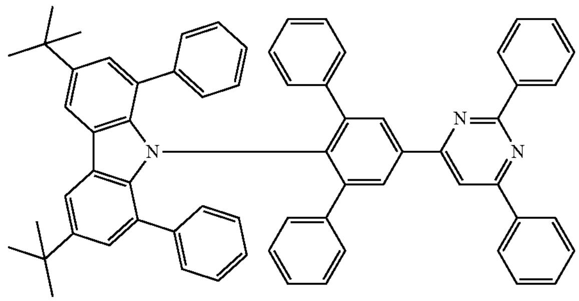
169
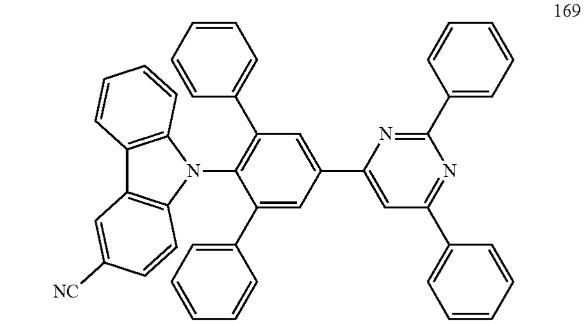
170
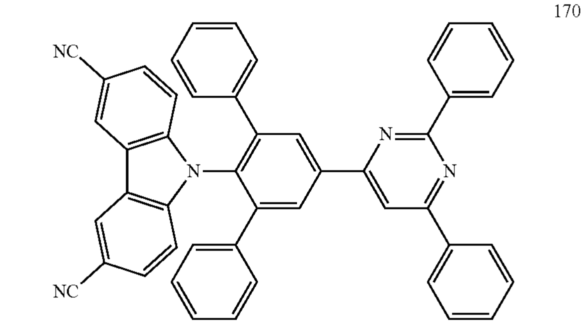

-continued
171
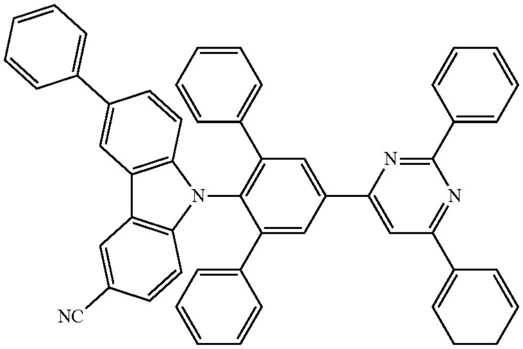
172
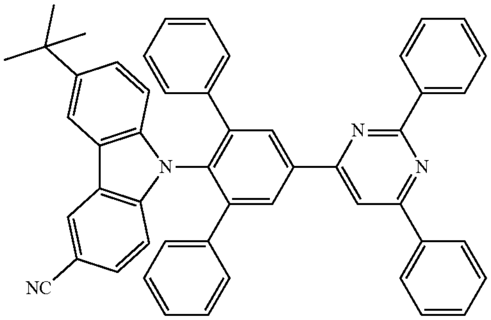
173
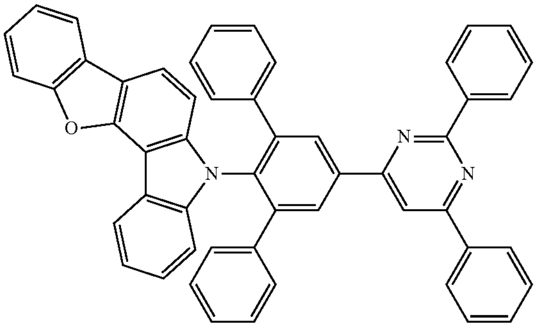
174
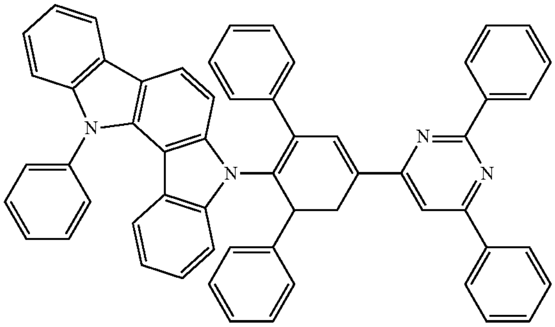
-continued
175
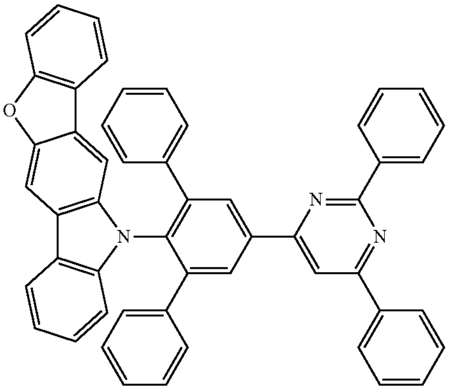
176
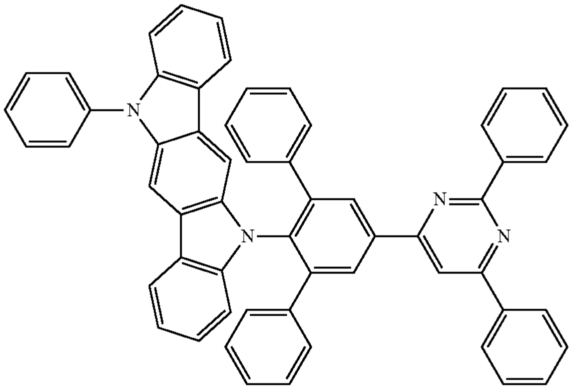
177
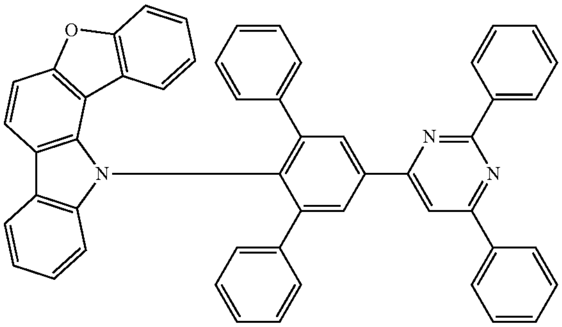
178
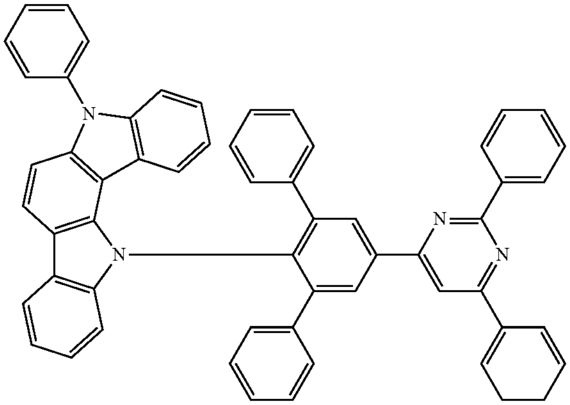

-continued
179
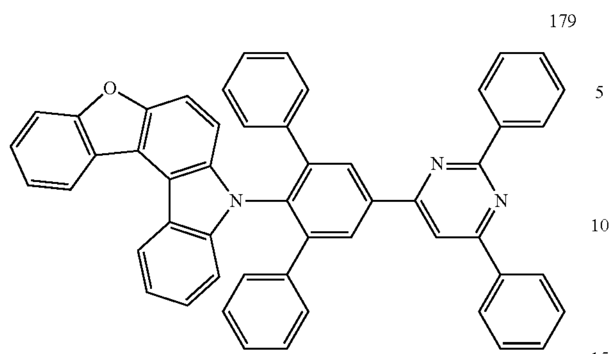
180
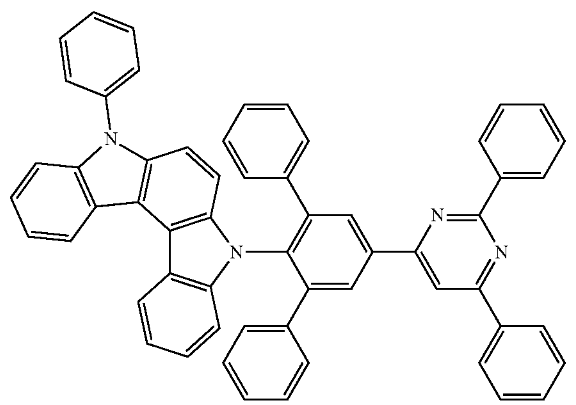
181
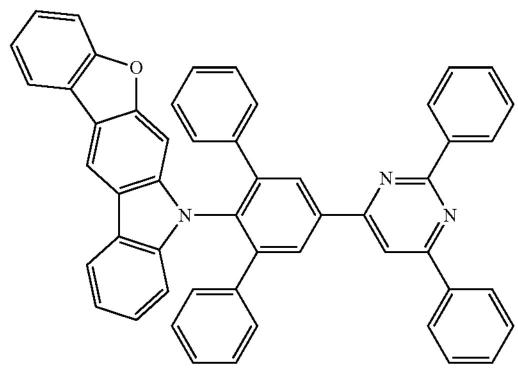
182
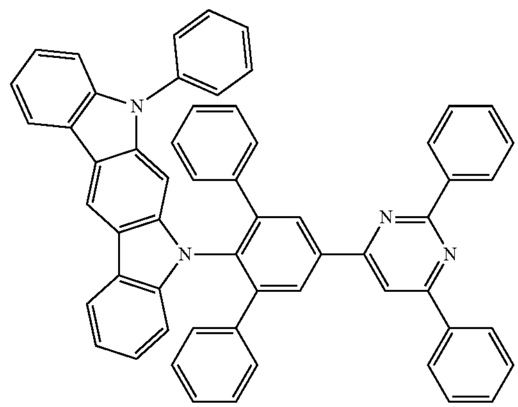
-continued
183
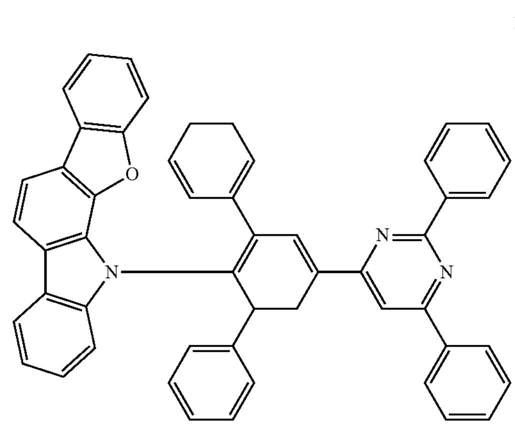
184
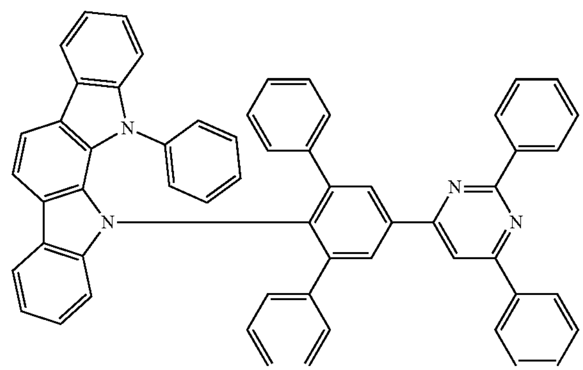
185
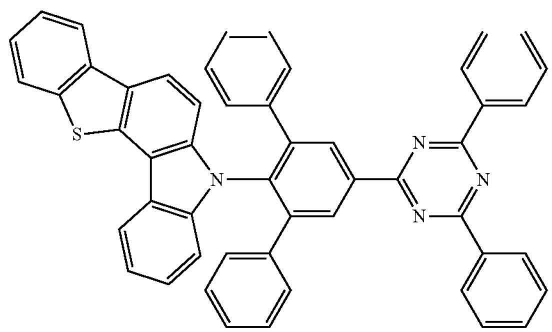
186
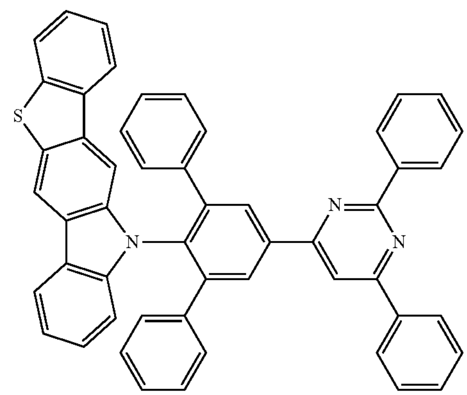

-continued
187
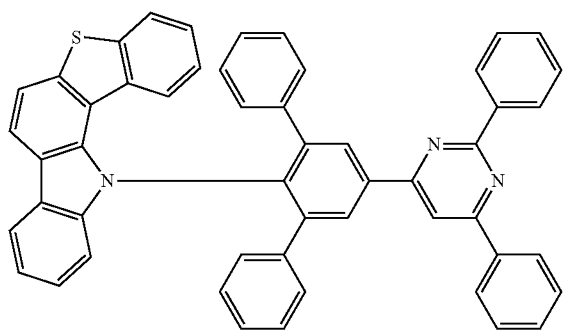
188
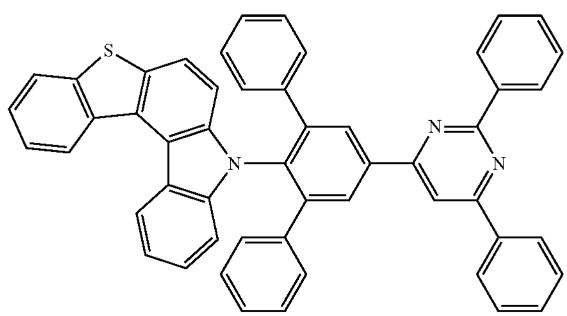
189
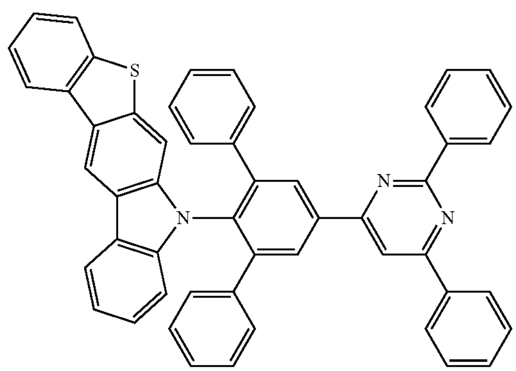
190
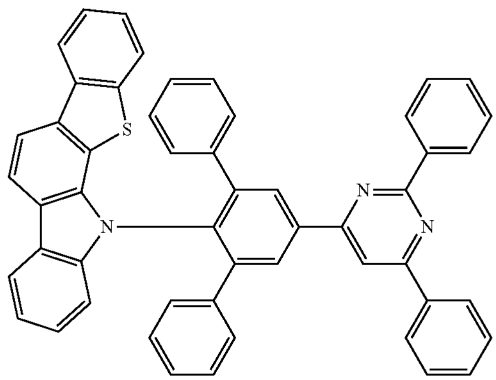
-continued
191
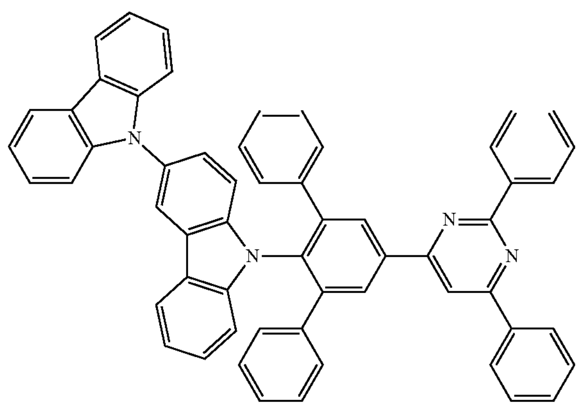
192
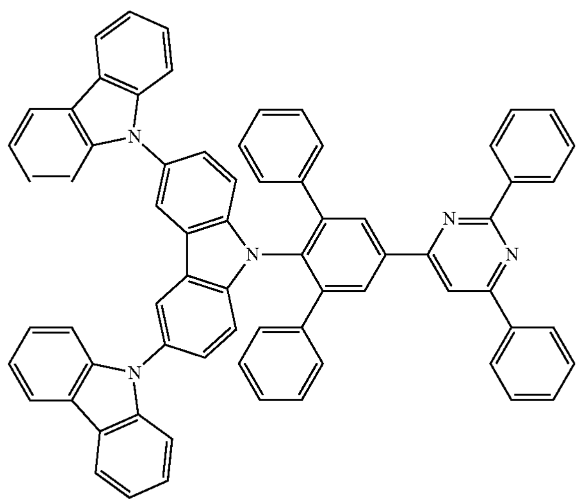
193
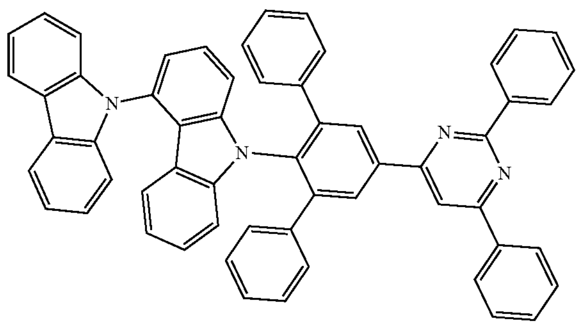

-continued
194
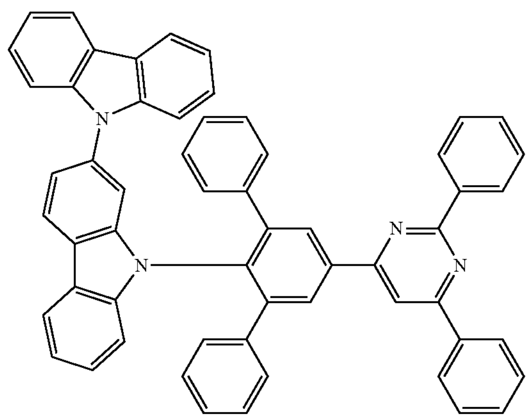
195
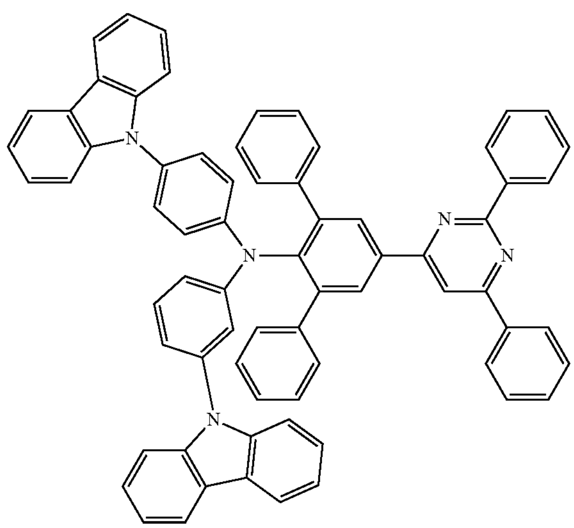
196
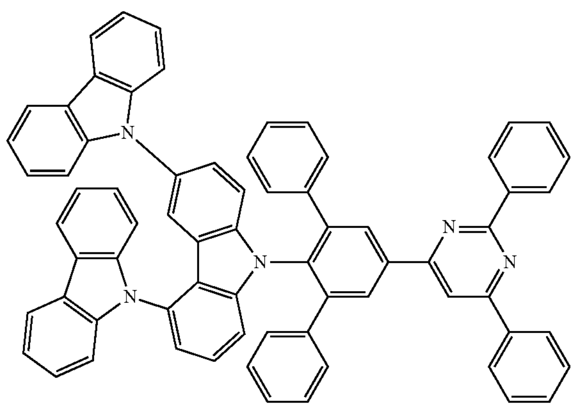
-continued
197
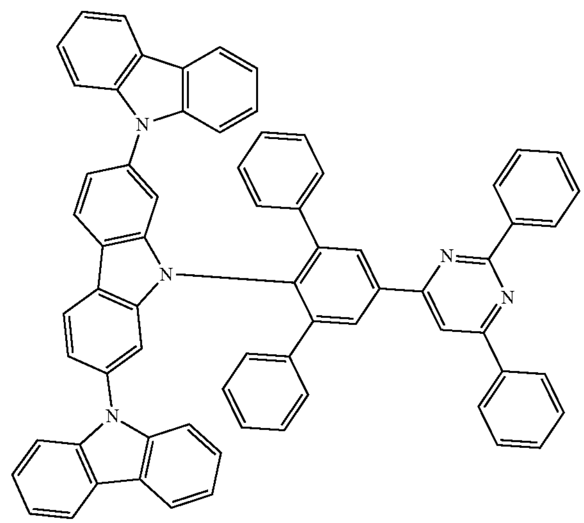
198
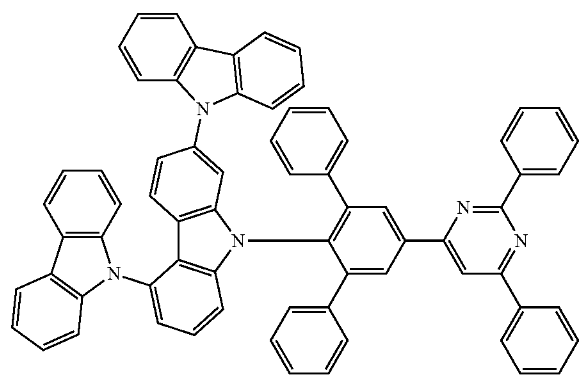
199
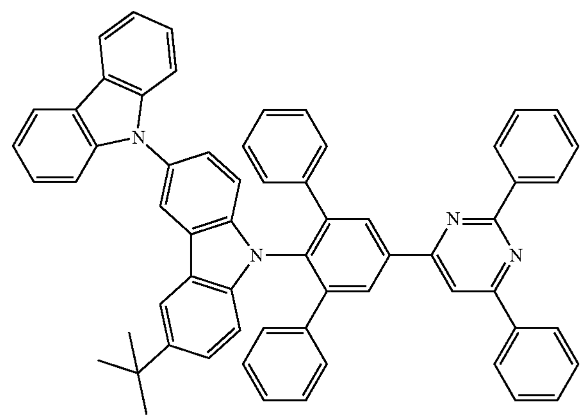

-continued
200
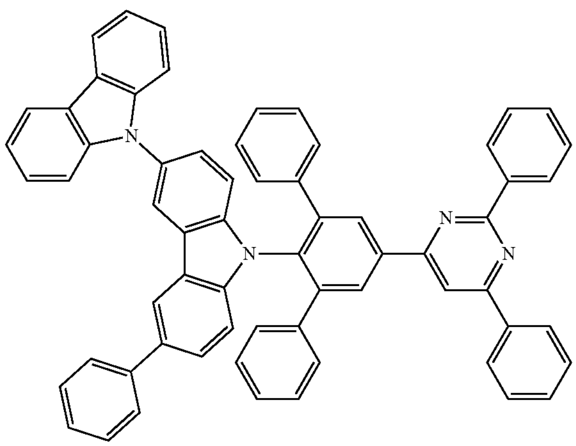
201
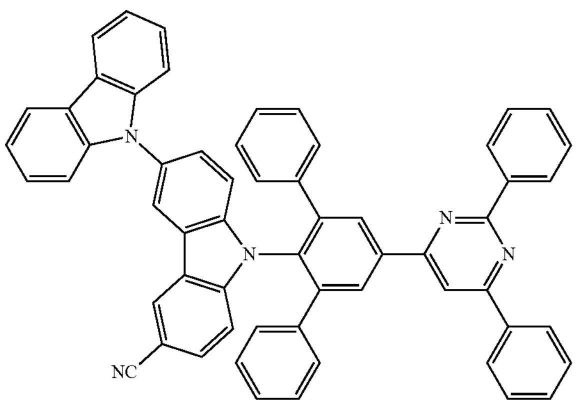
202
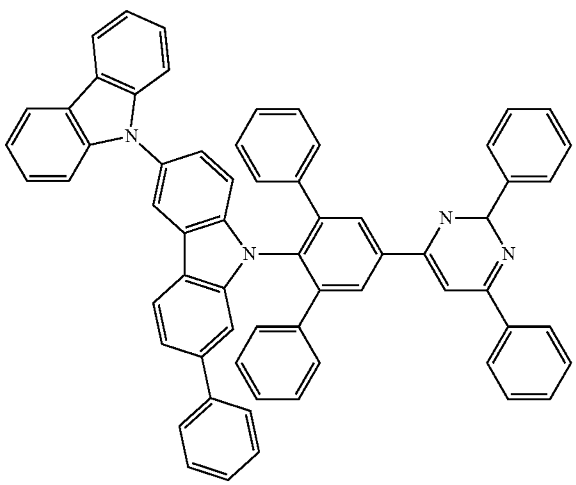
-continued
203
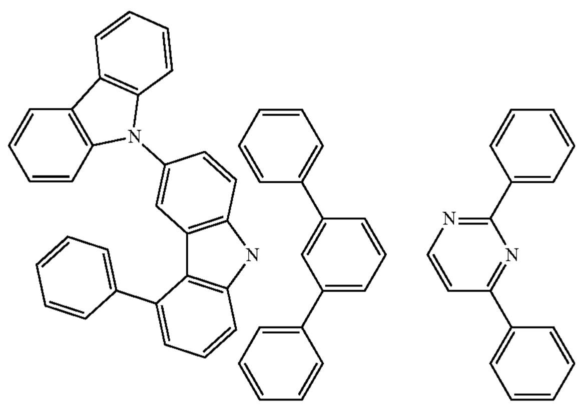
204
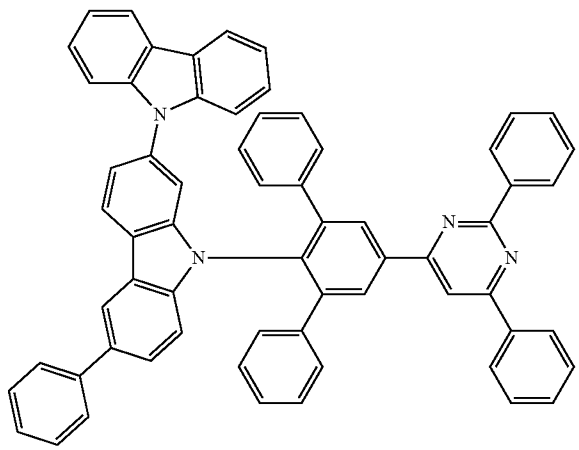
205
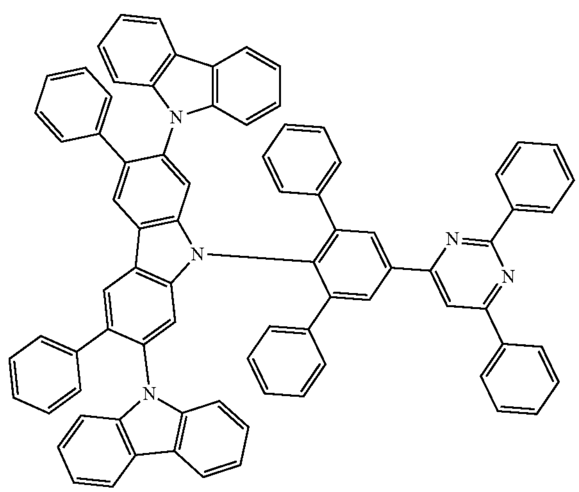

-continued
206
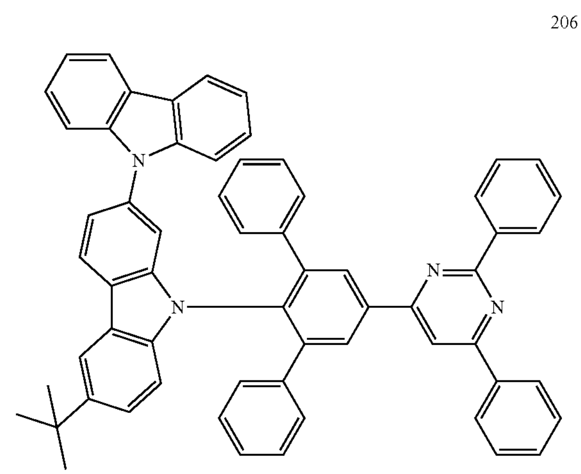
207
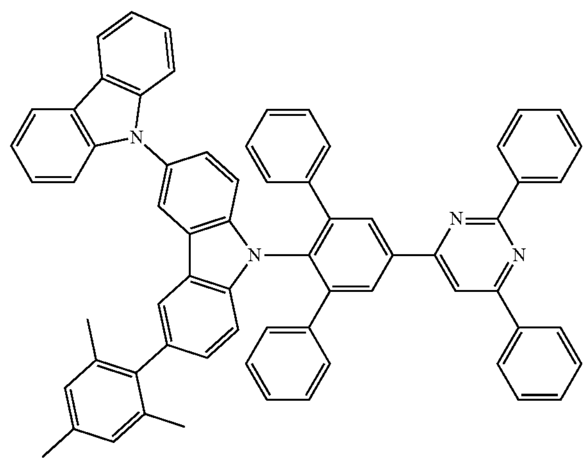
208
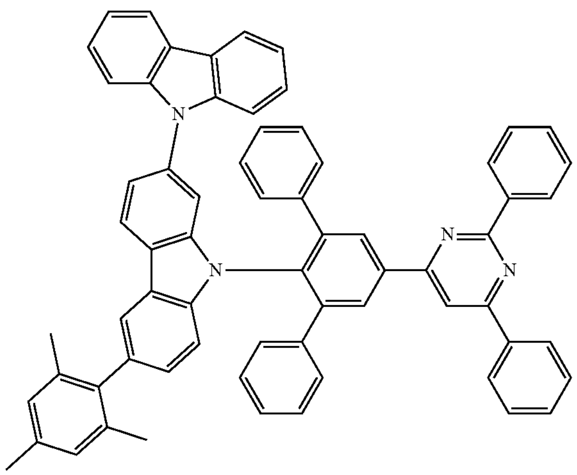
-continued
209
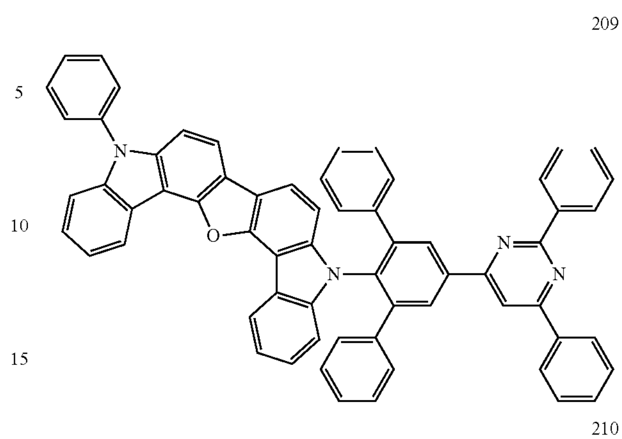
210
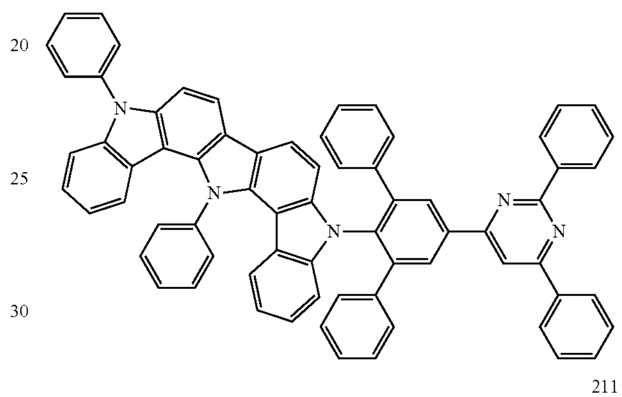
211
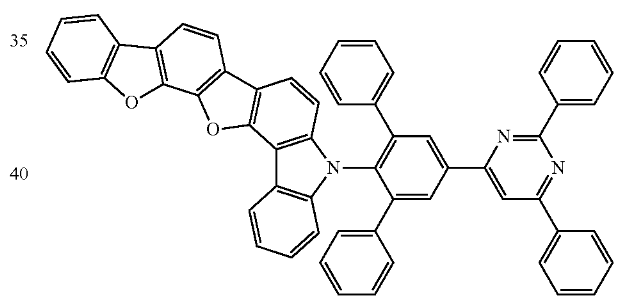
212
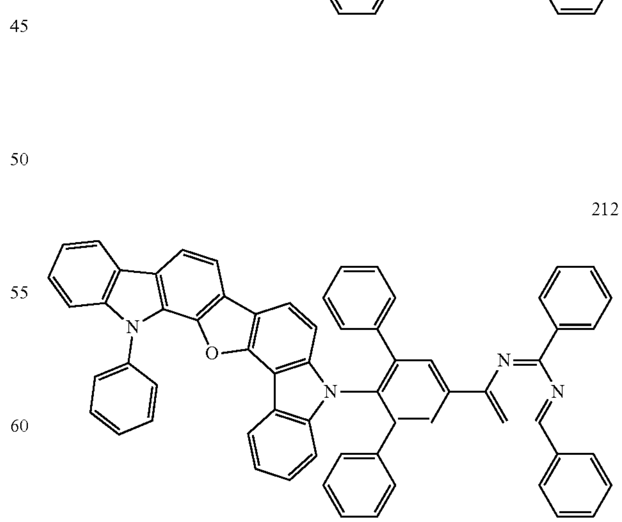

-continued
213
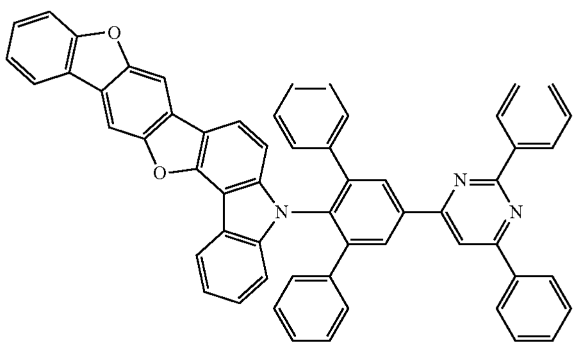
214
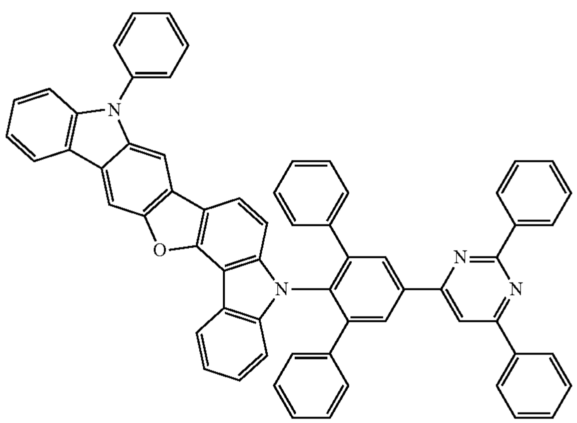
215
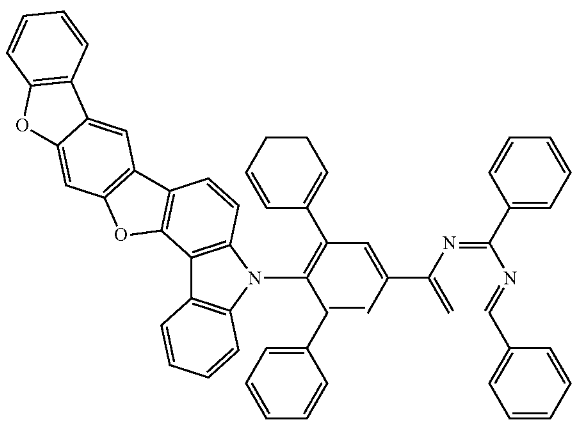
216
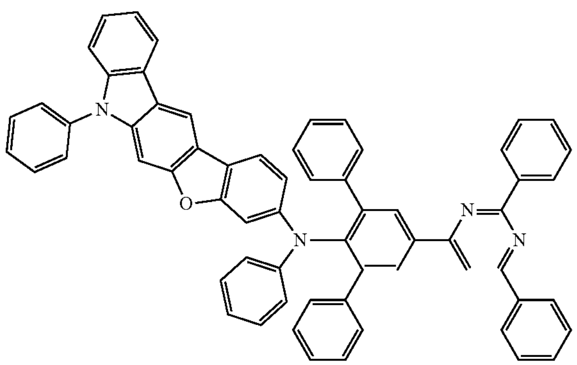
-continued
217
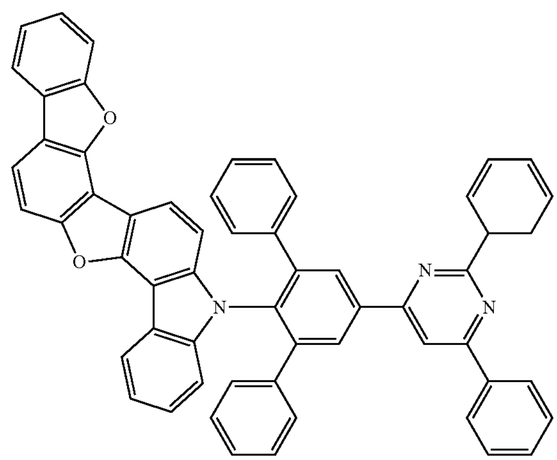
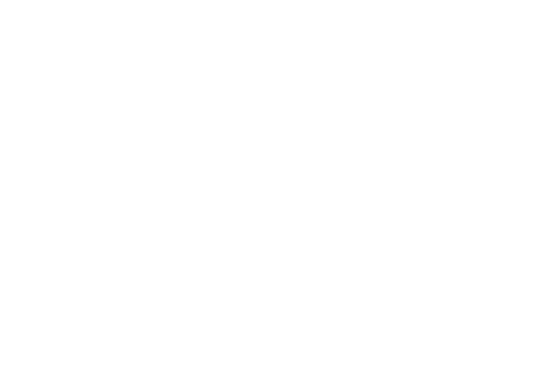
218
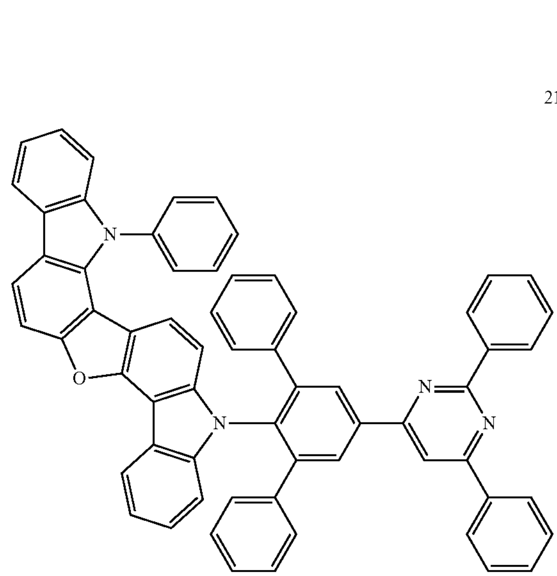
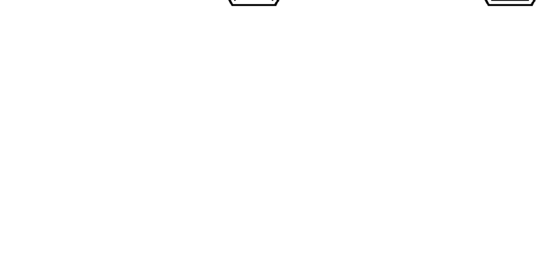

219
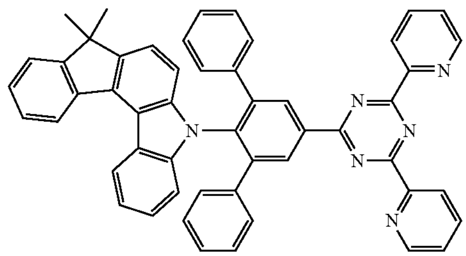
220
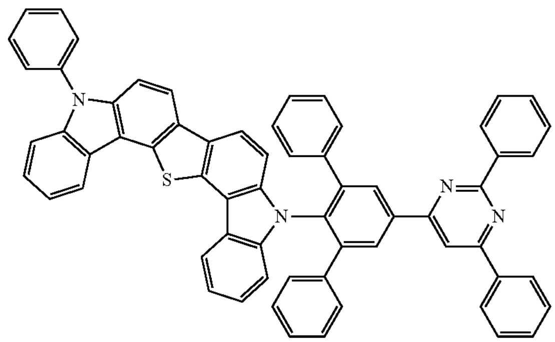
221
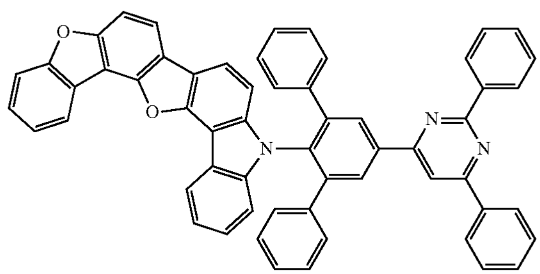
222
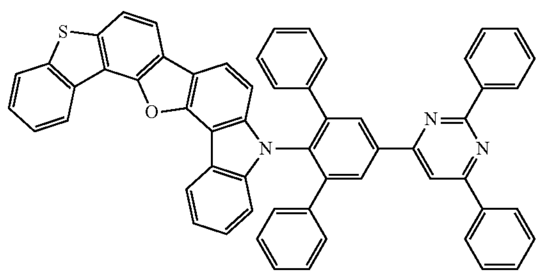
223
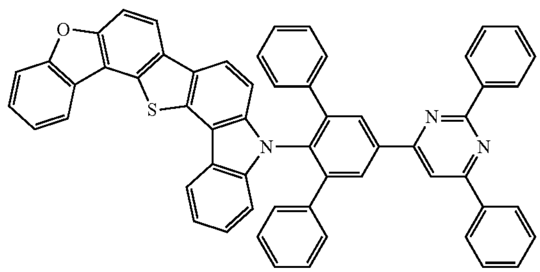
224
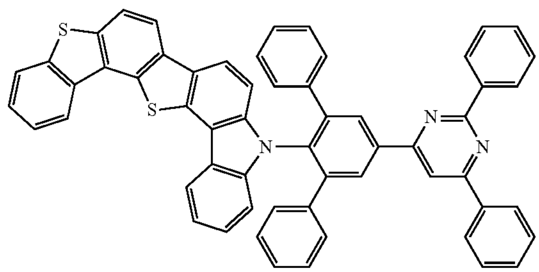
225
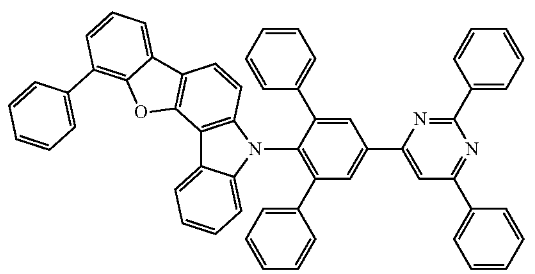
226
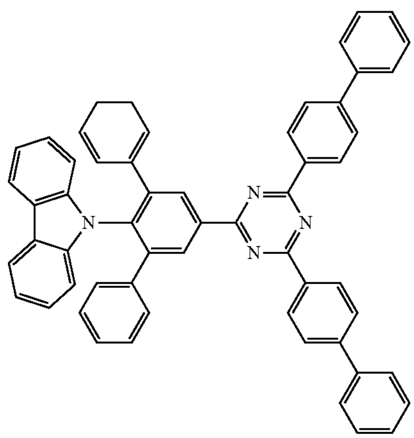

-continued
227
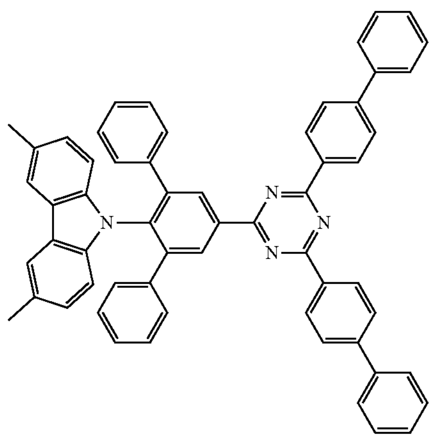
228
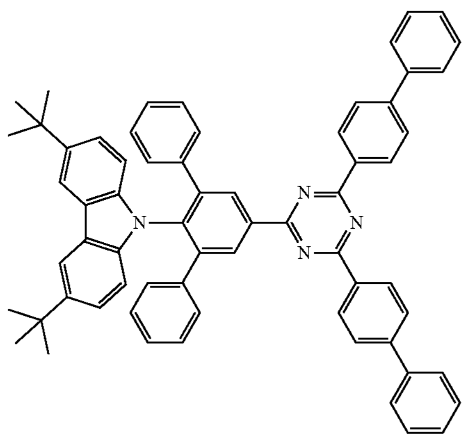
229
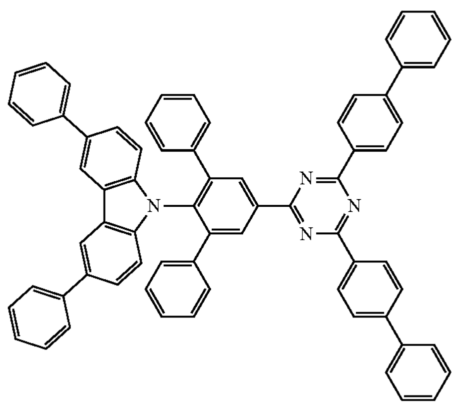
230
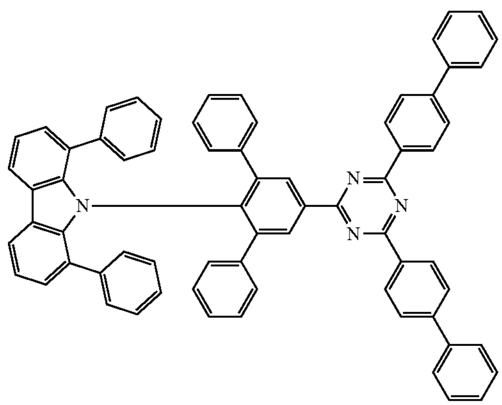
231
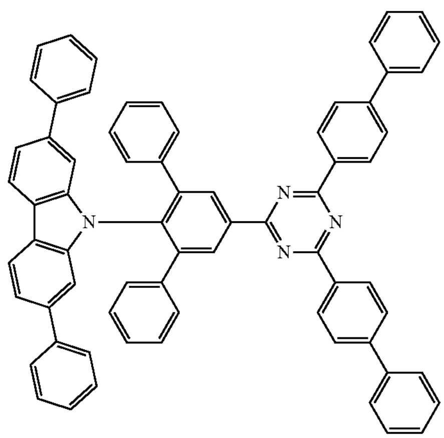
232
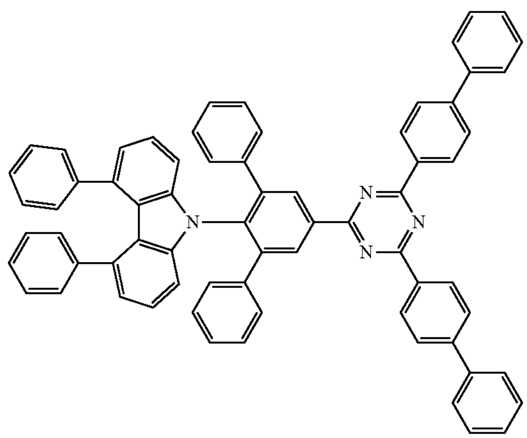

-continued
233
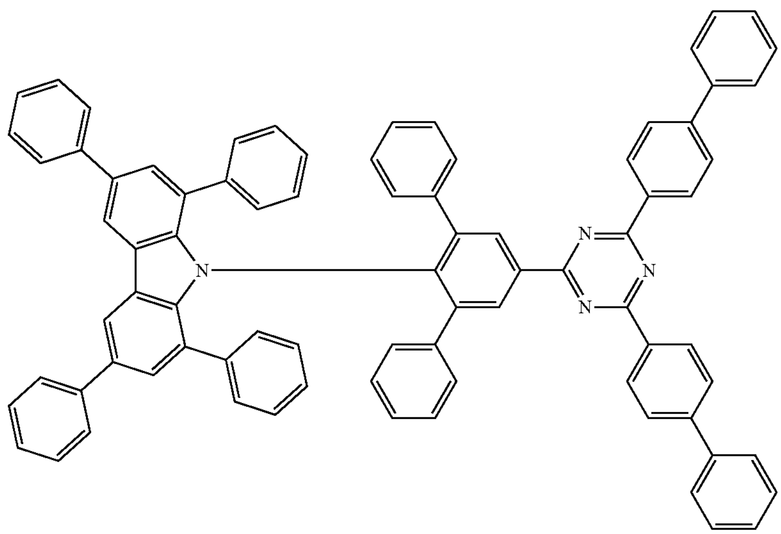
234
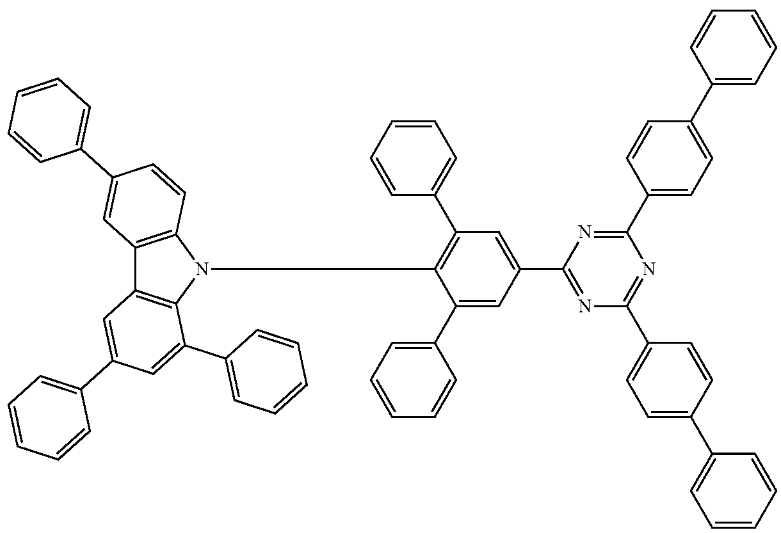
235
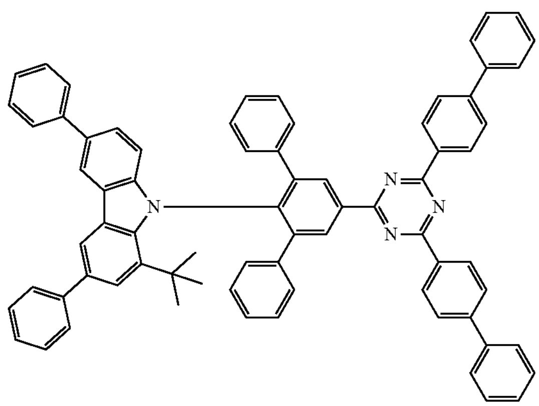
236
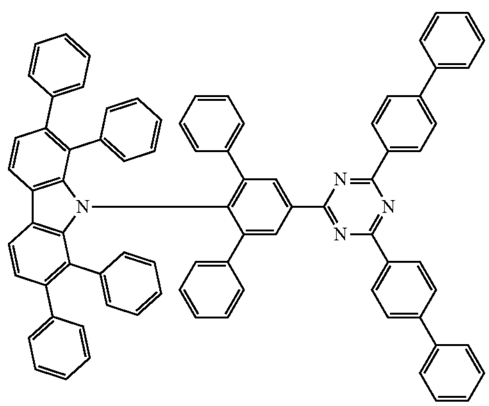

-continued
237
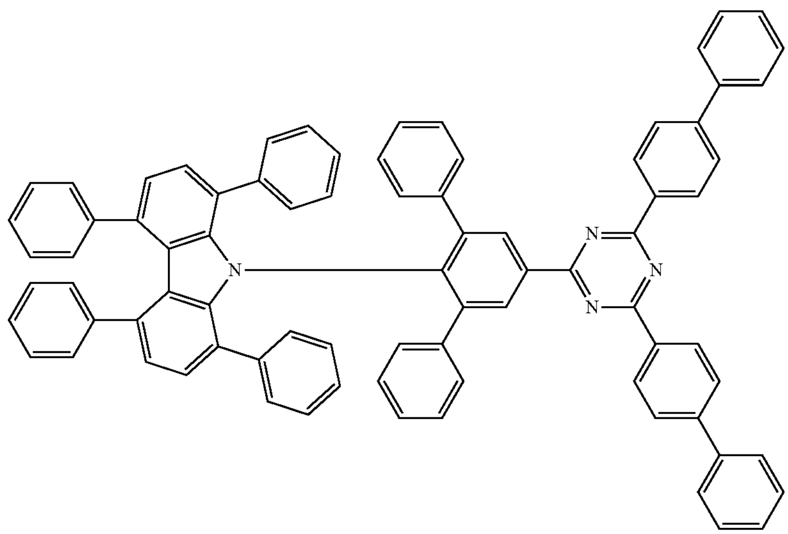
238
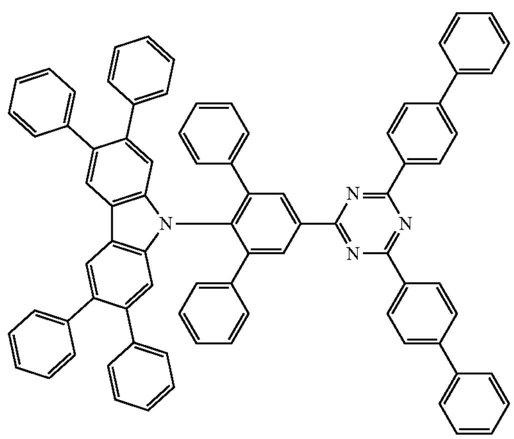
239
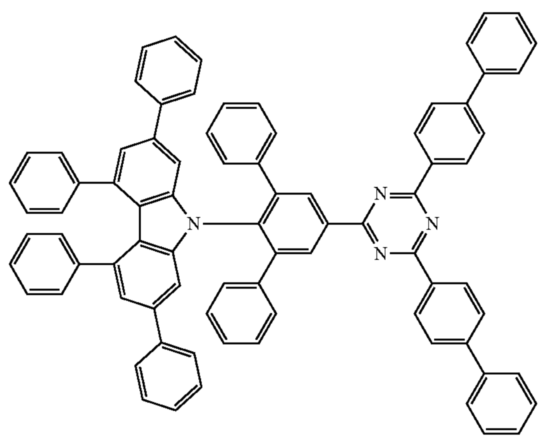
240
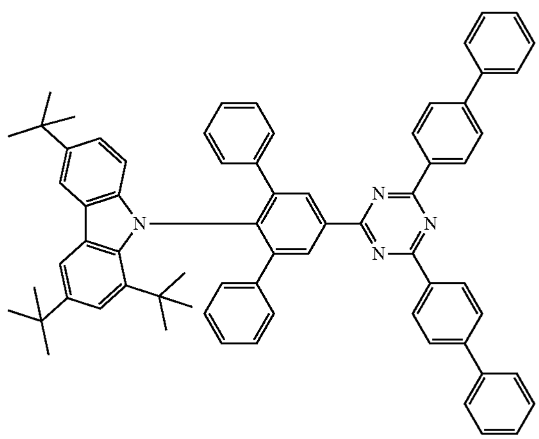
241
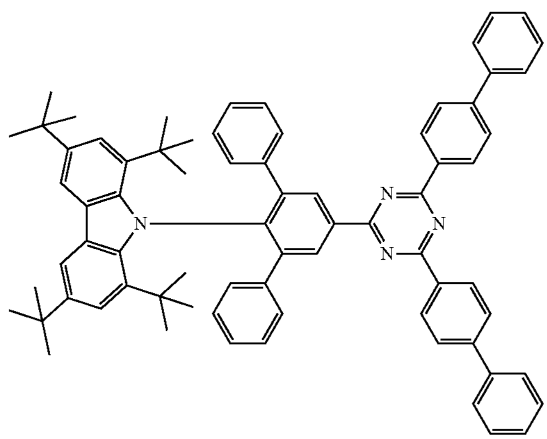

-continued
242
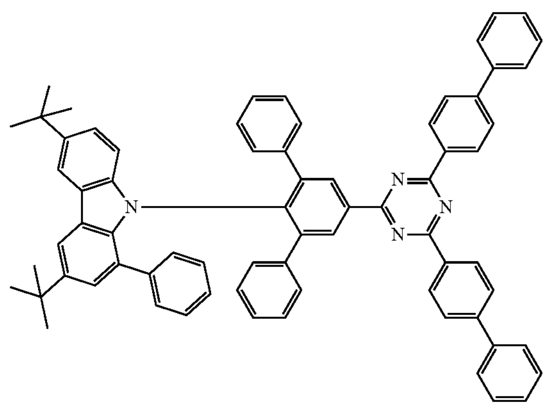
243
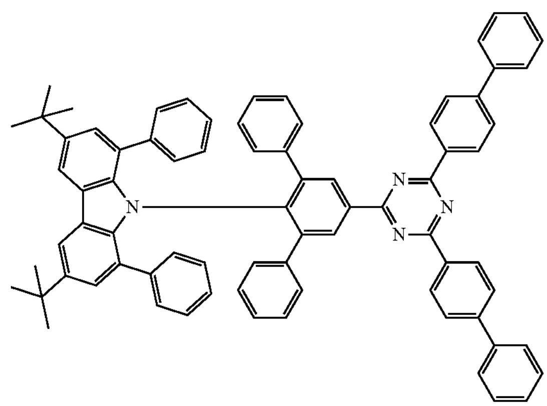
244
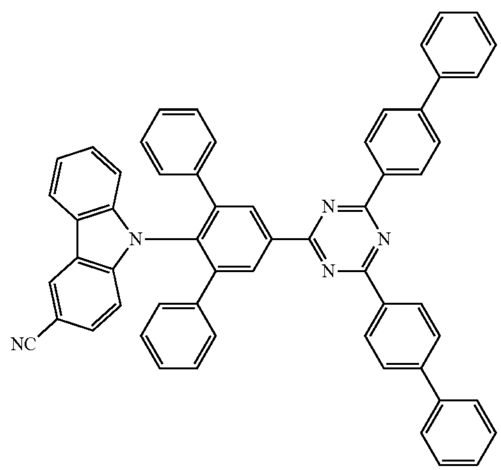
245
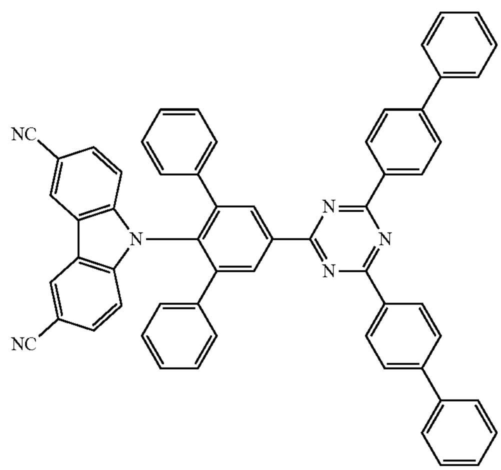
246
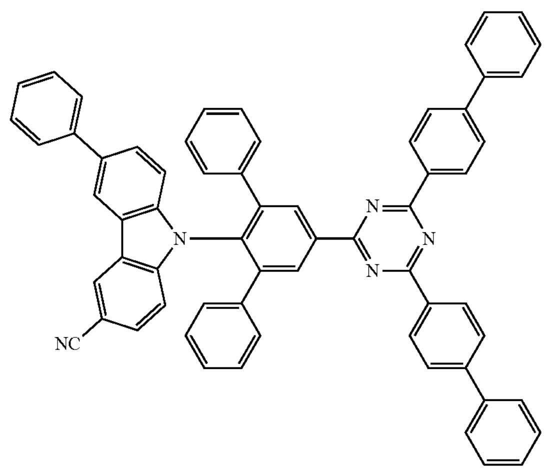
247
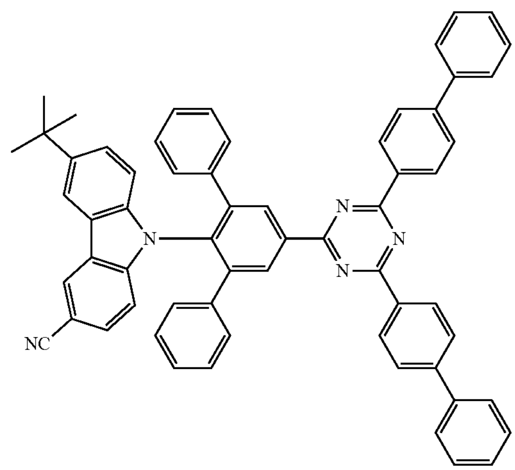

-continued
248
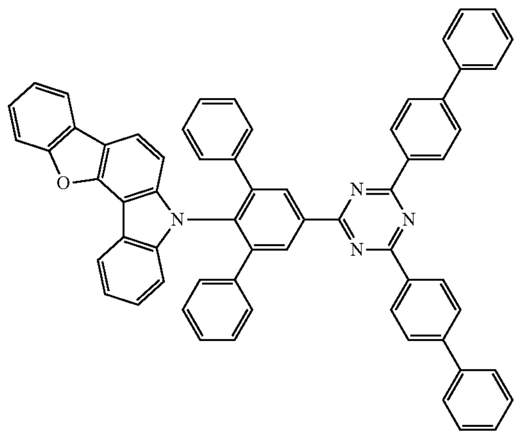
249
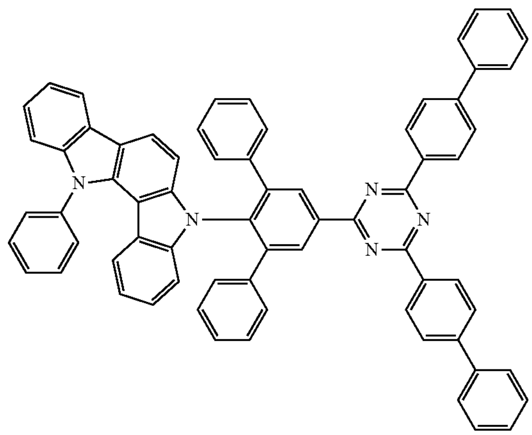
250
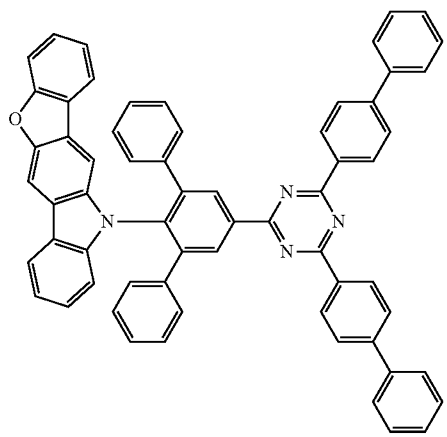
251
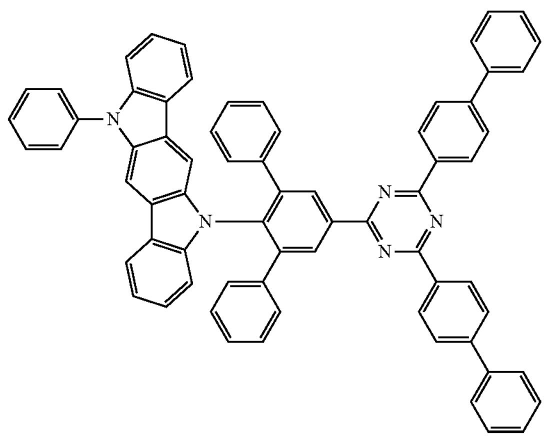
252
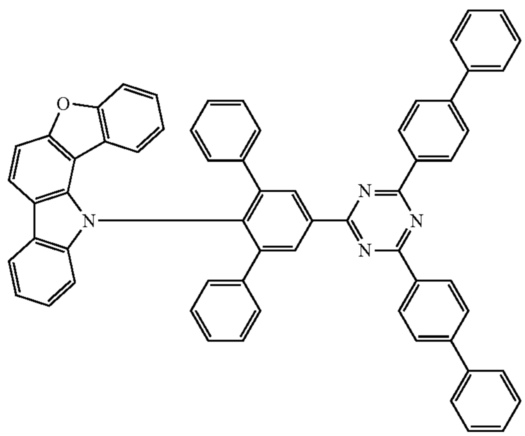
253
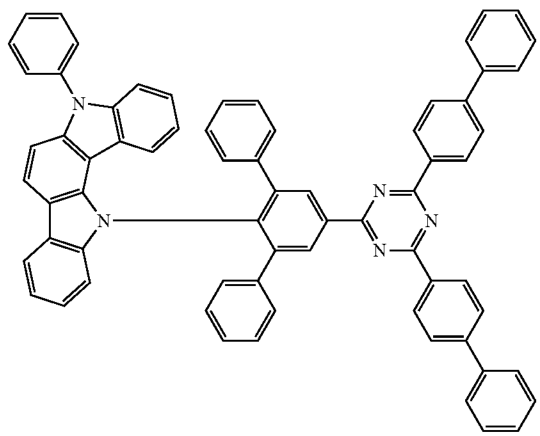

-continued
254
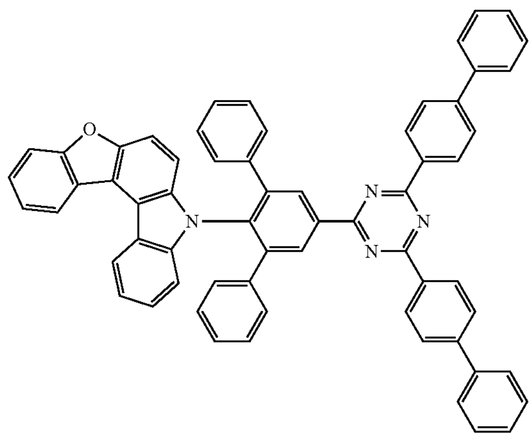
255
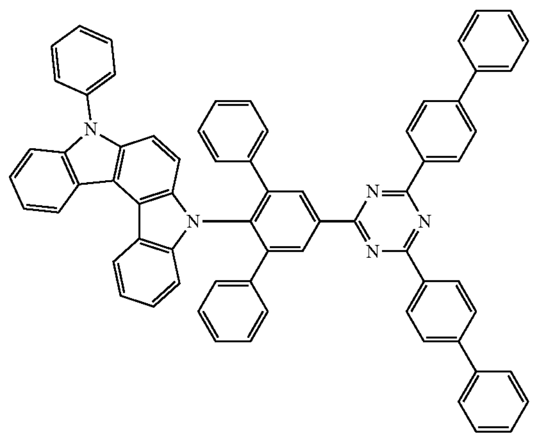
256
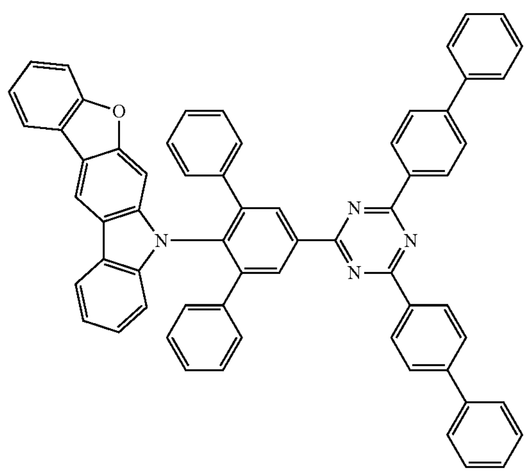
257
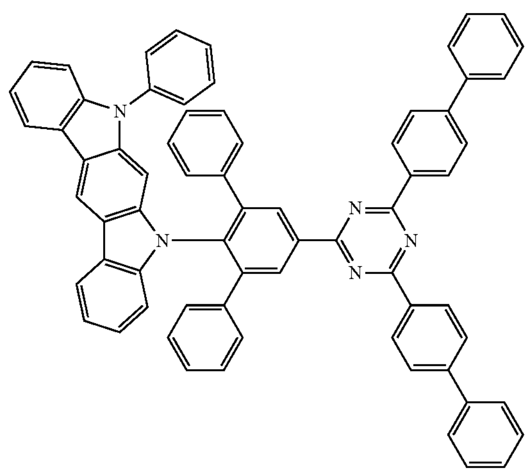
258
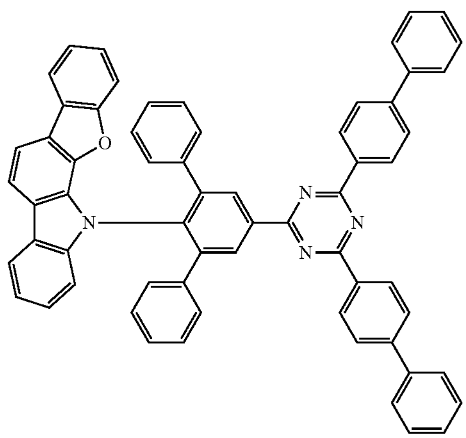
259
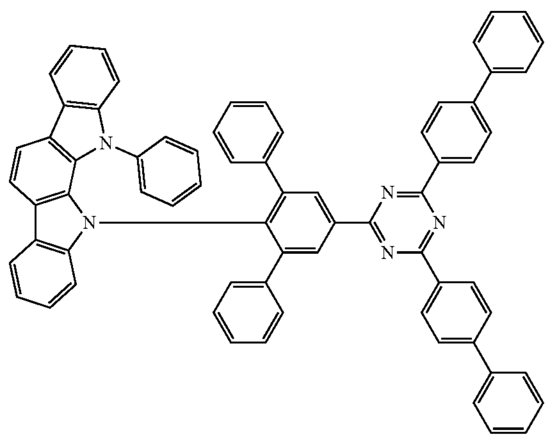

-continued
260
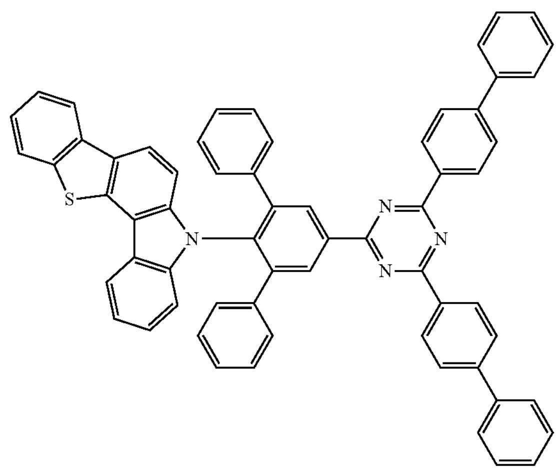
261
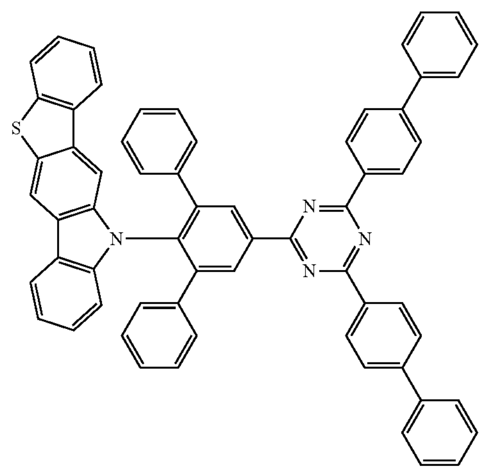
262
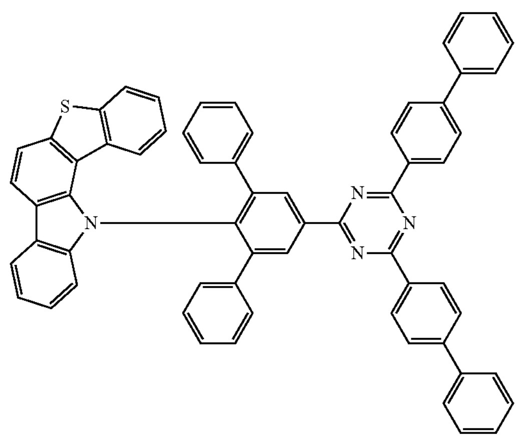
263
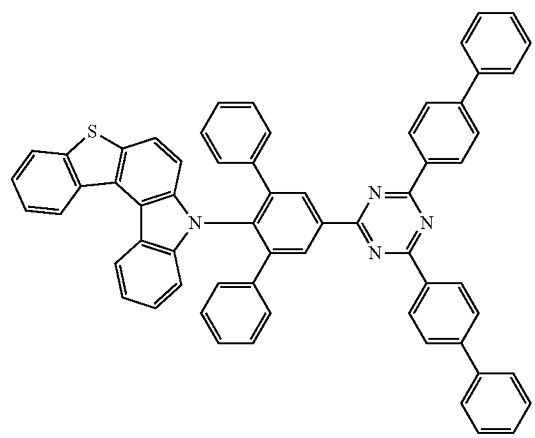
264
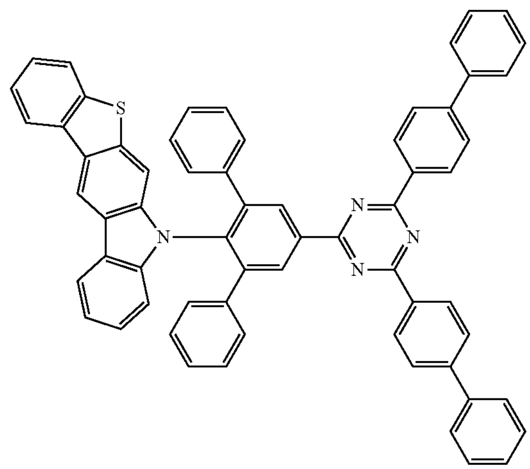
265
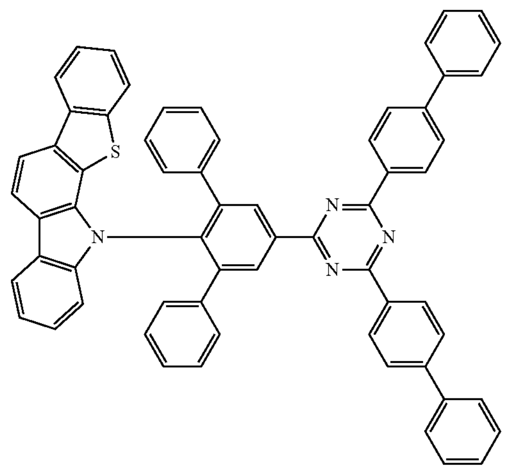

-continued
266
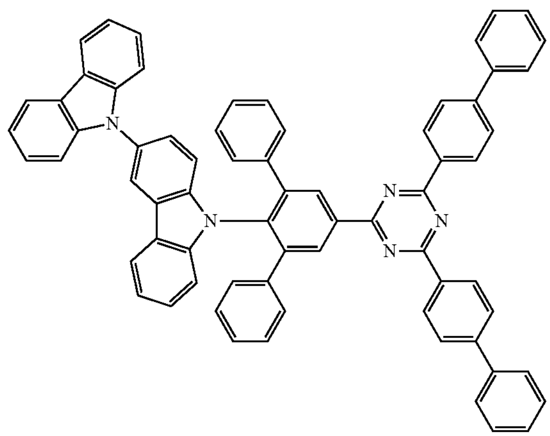
267
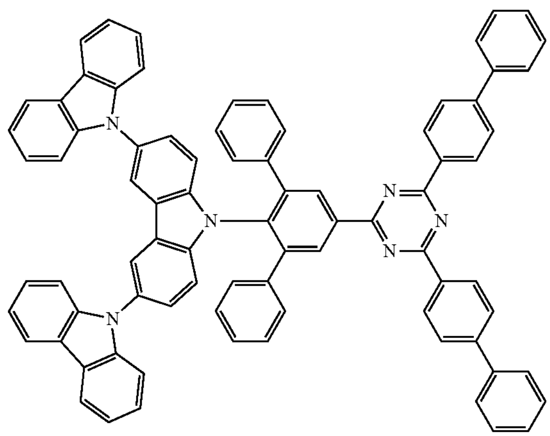
268
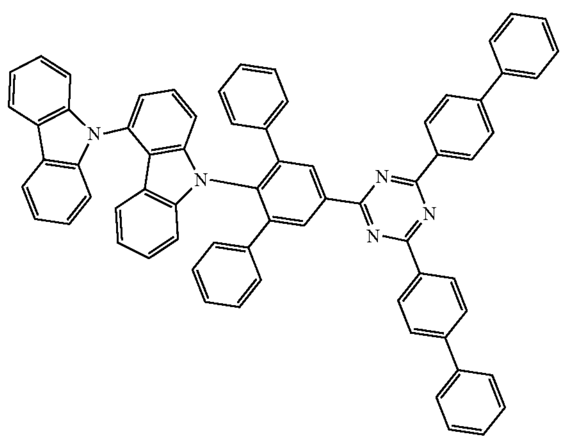
269
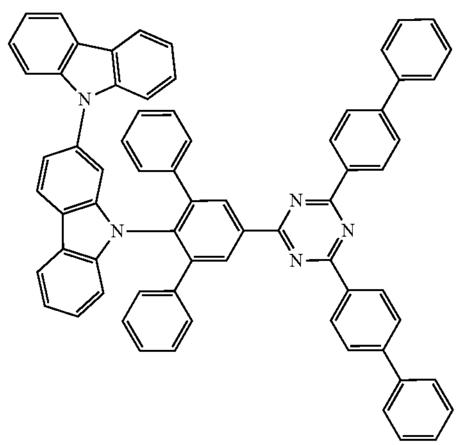
270
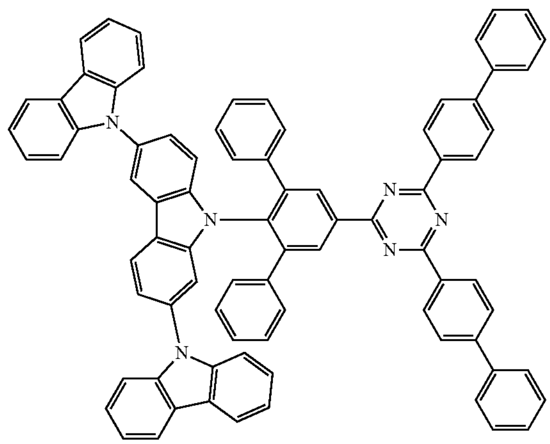
271
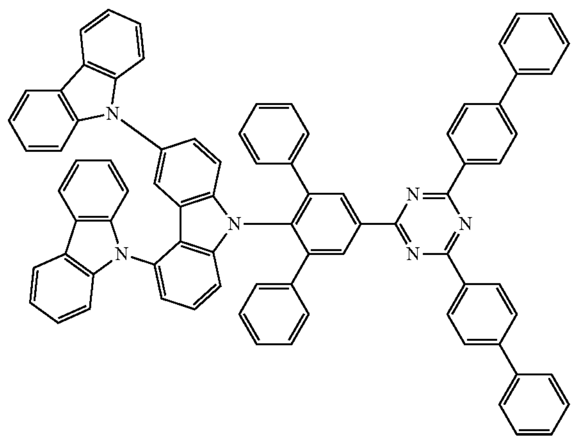

-continued
272
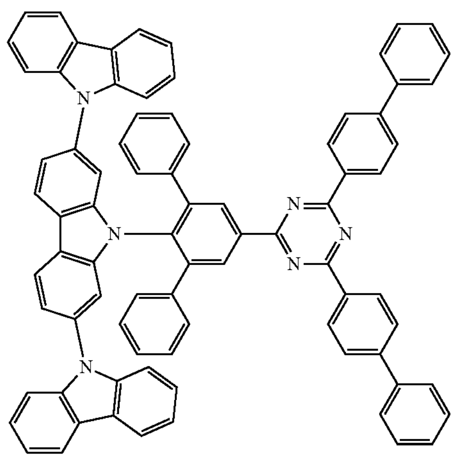
273
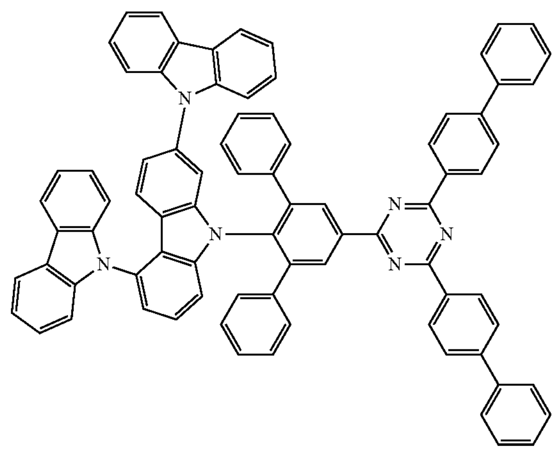
274
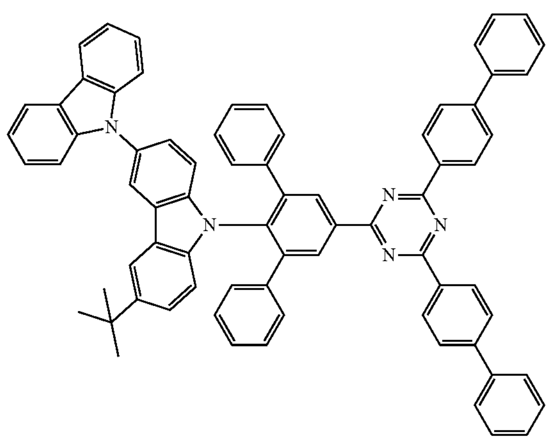
275
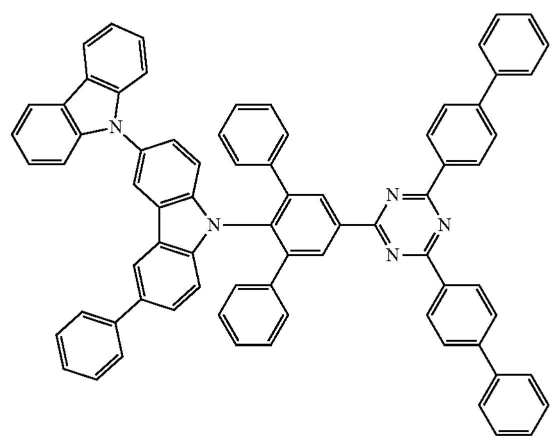
276
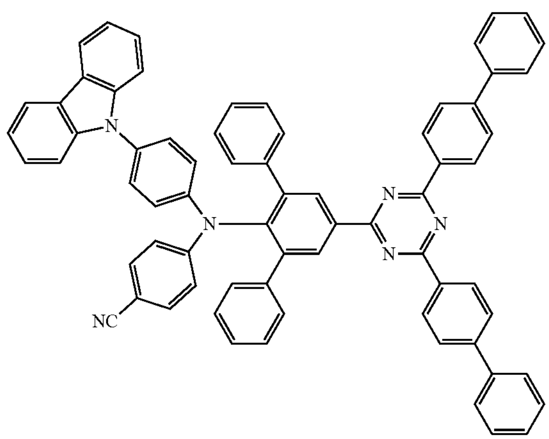
277
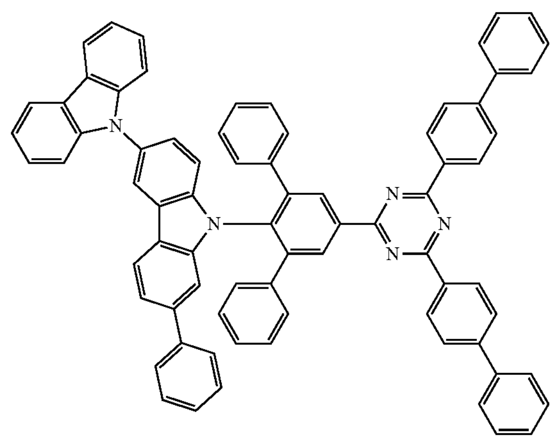

-continued
278
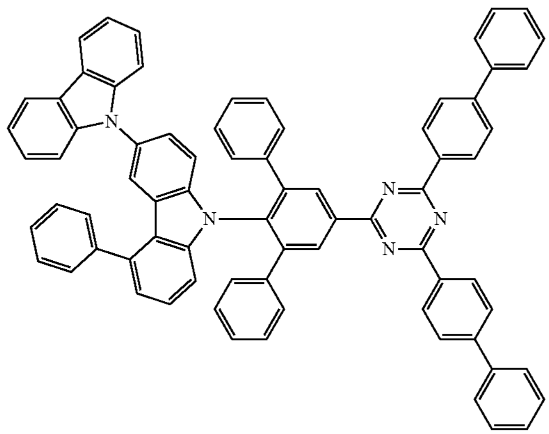
279
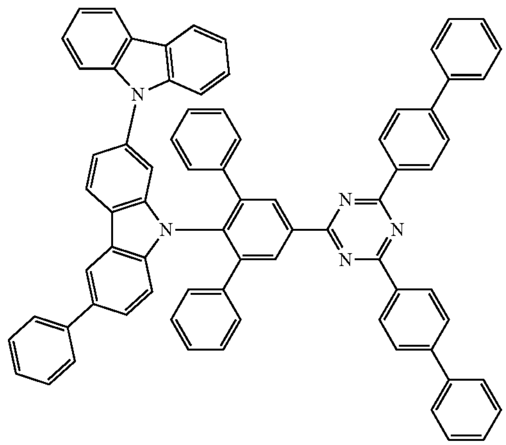
280
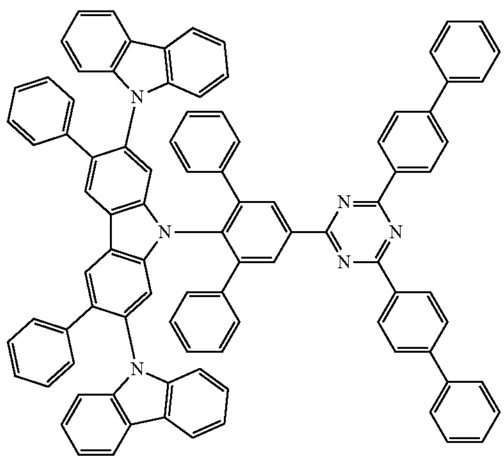
281
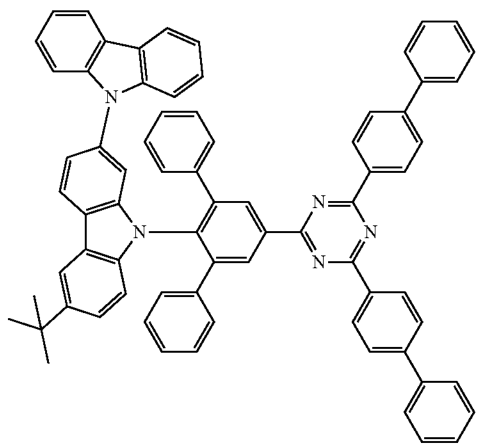
282
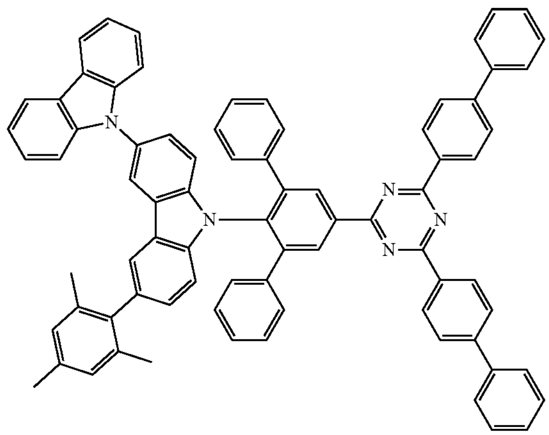
283
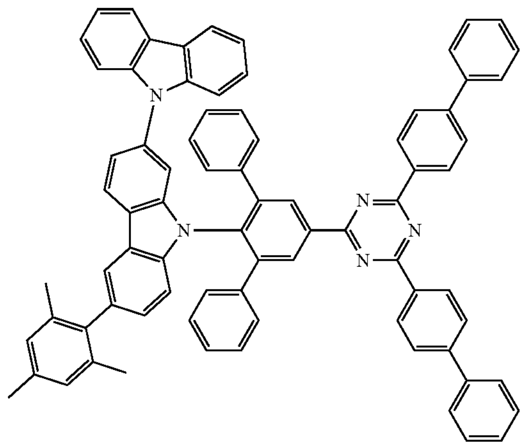

-continued
284
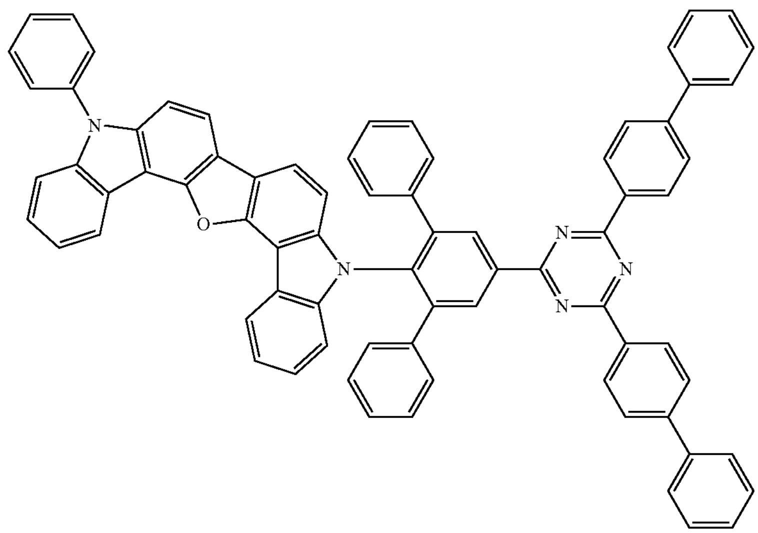
285
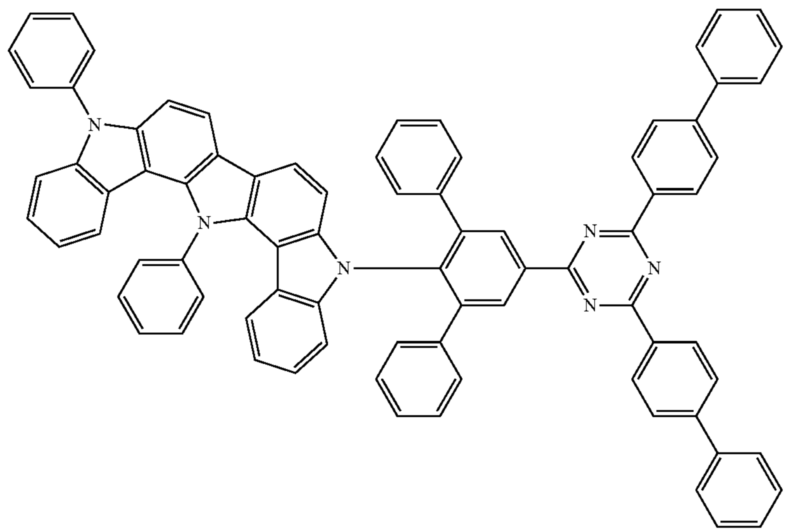
286
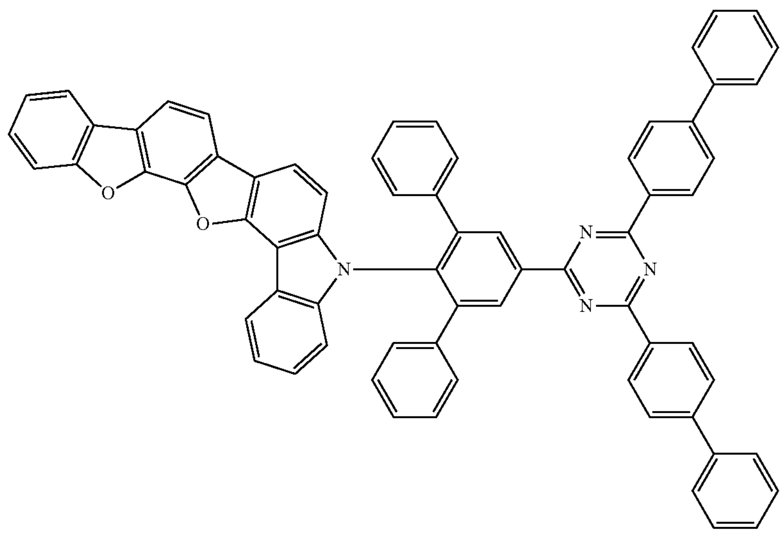

-continued
287
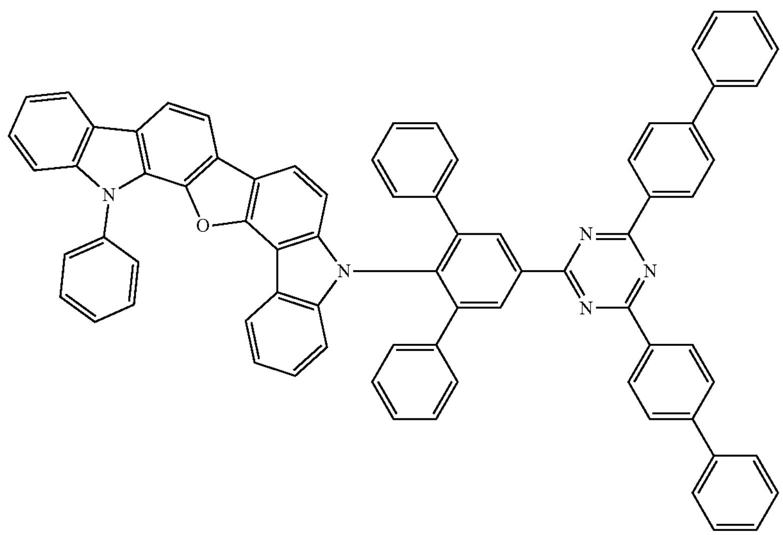
288
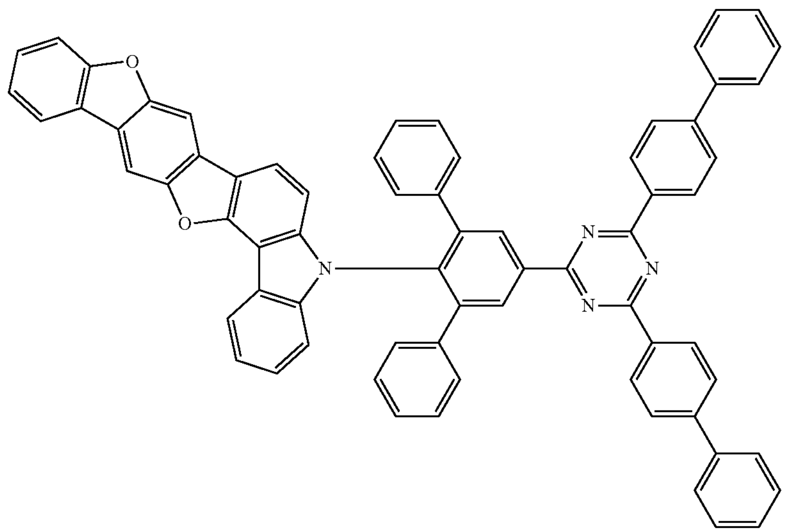
289
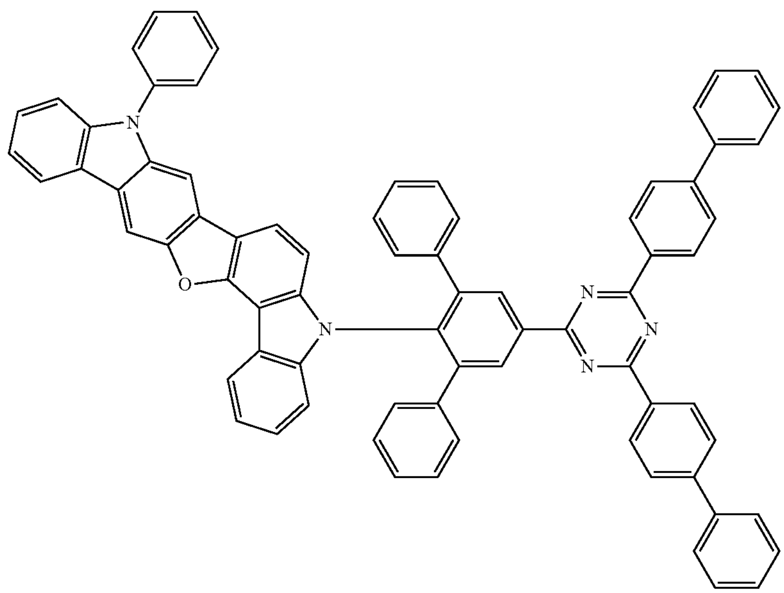

-continued
290
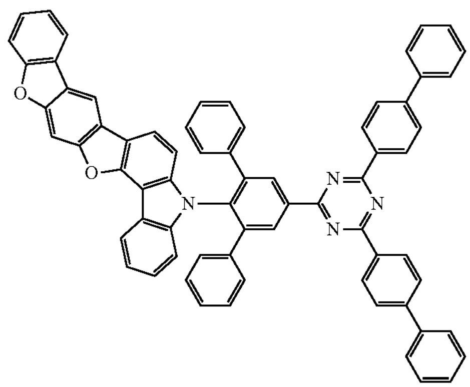
291
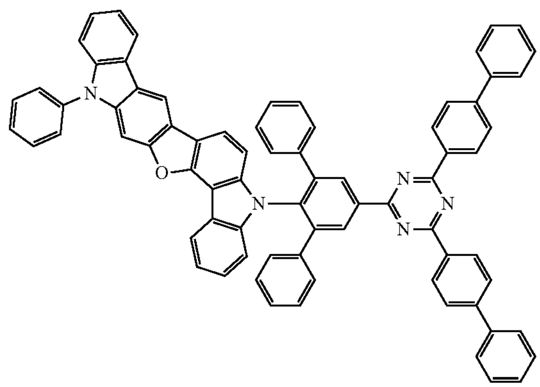
292
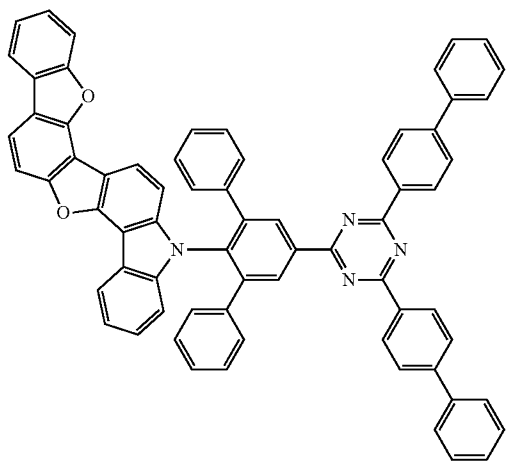
293
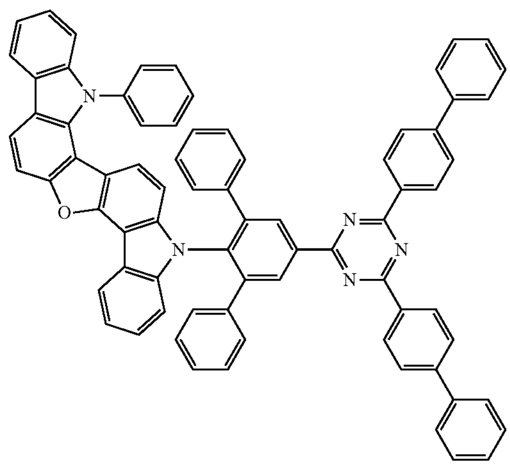
294
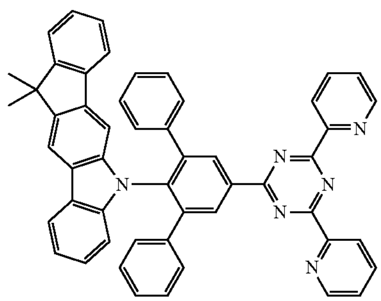
295
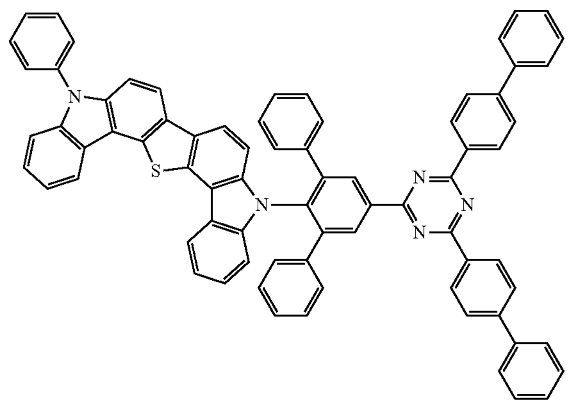

-continued
296
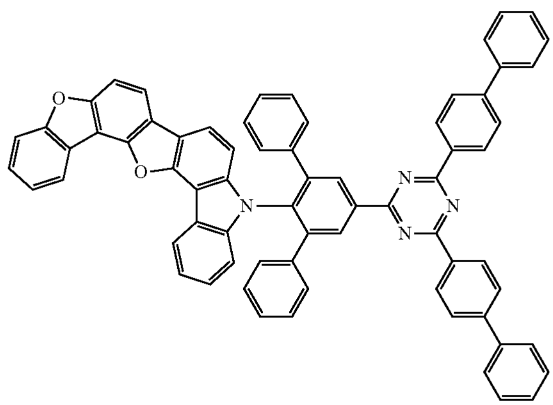
297
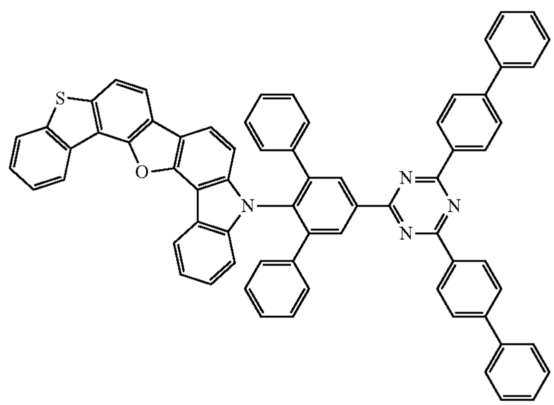
298
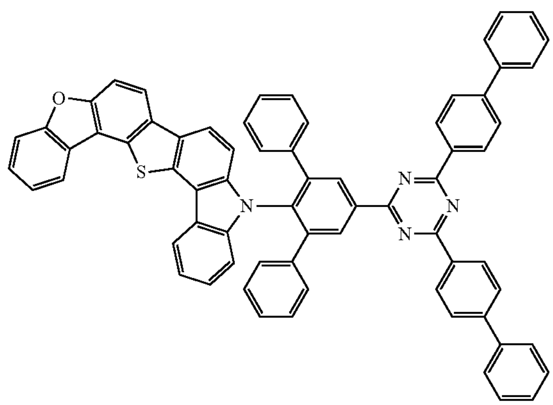
299
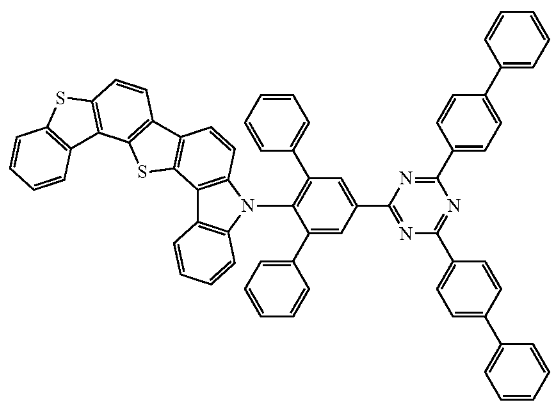
300
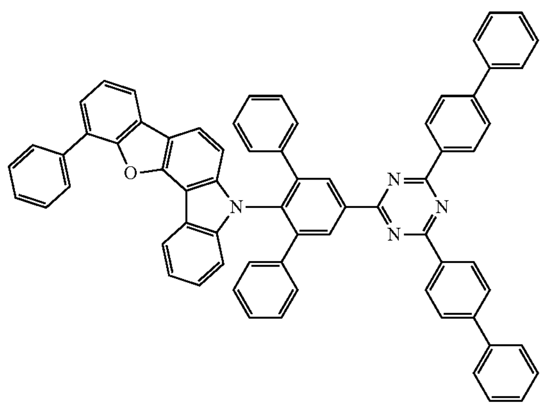
301
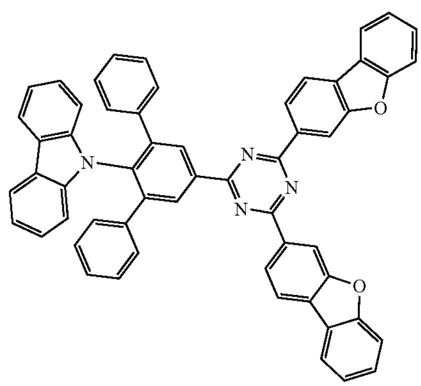

-continued
302
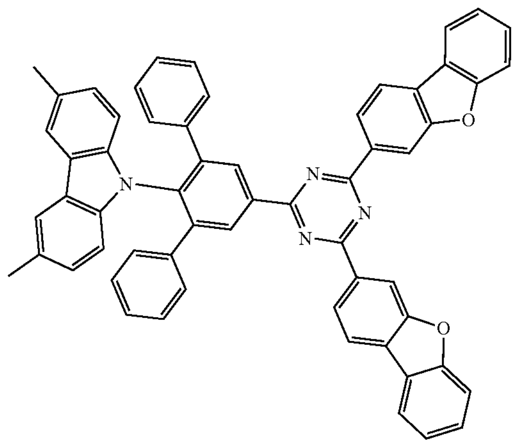
303
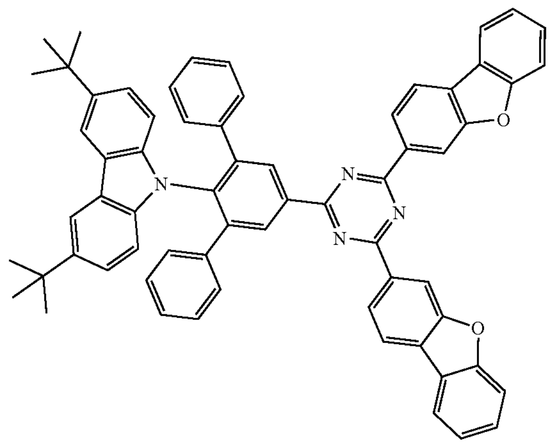
304
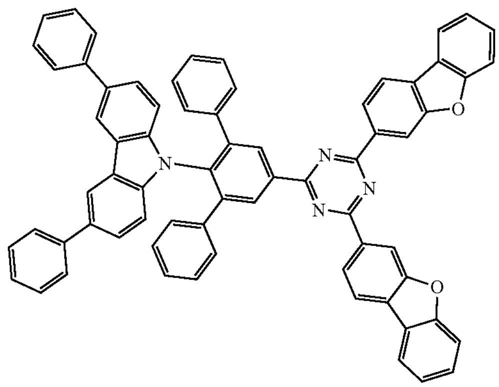
305
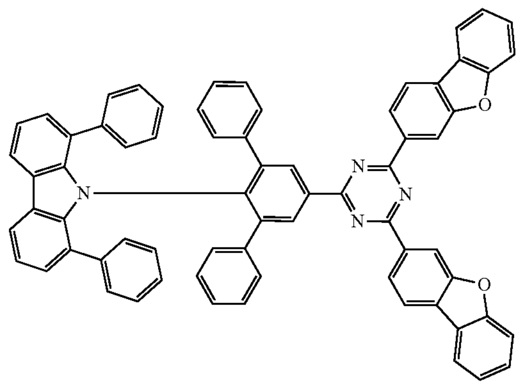
306
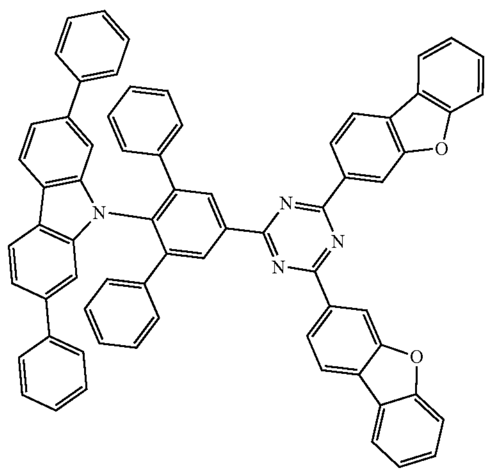
307
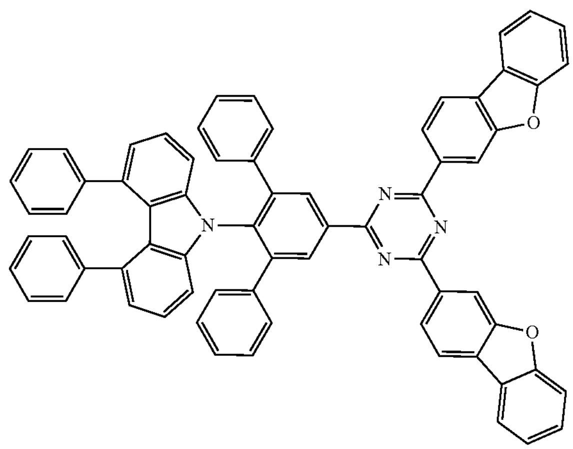

-continued
308
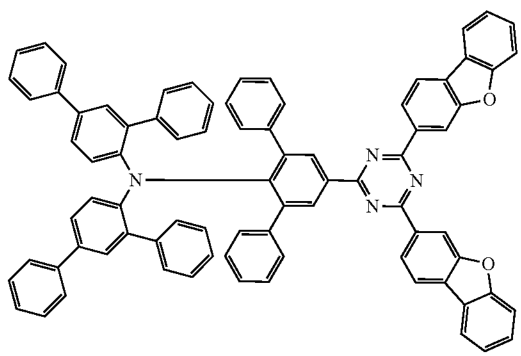
309
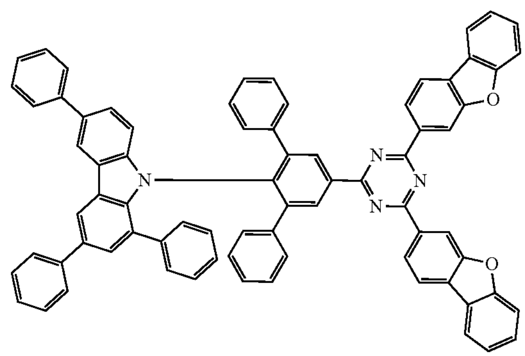
310
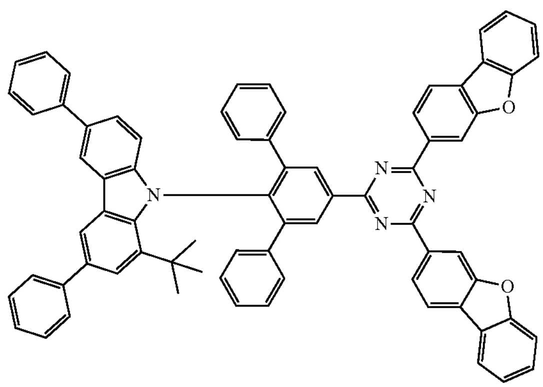
311
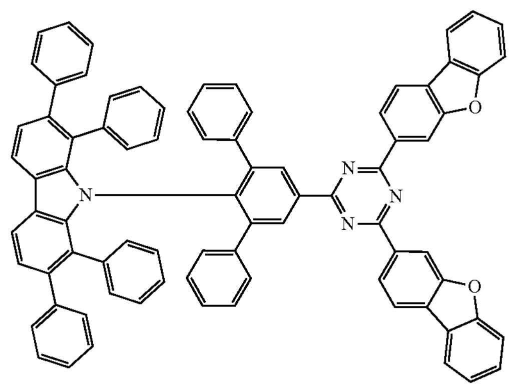
312
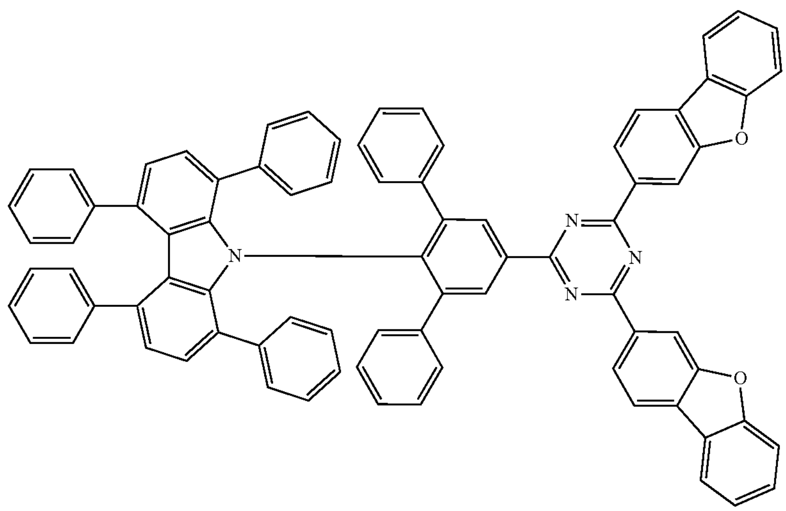

-continued
313
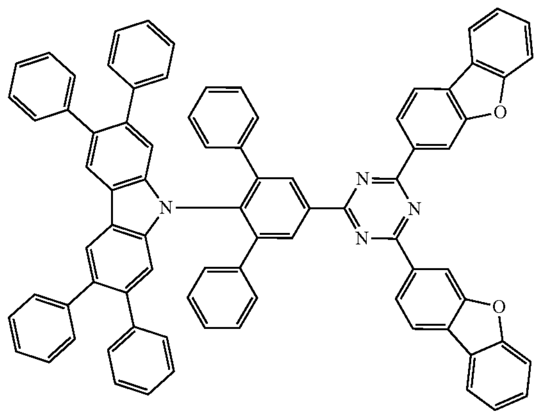
314
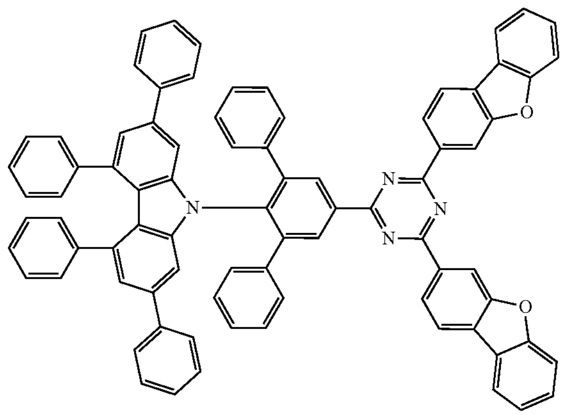
315
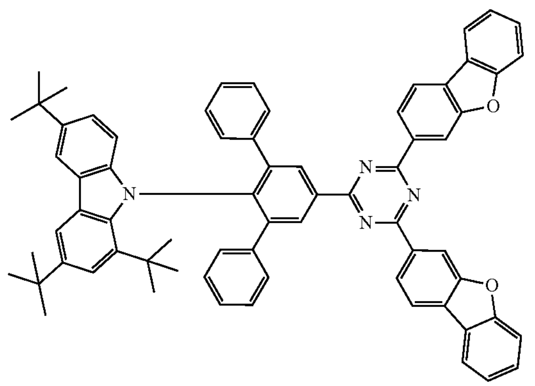
316
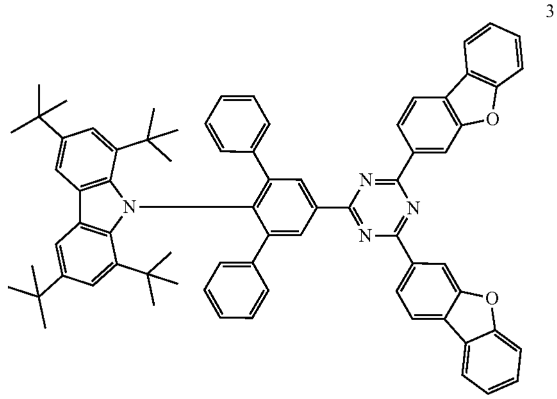
317
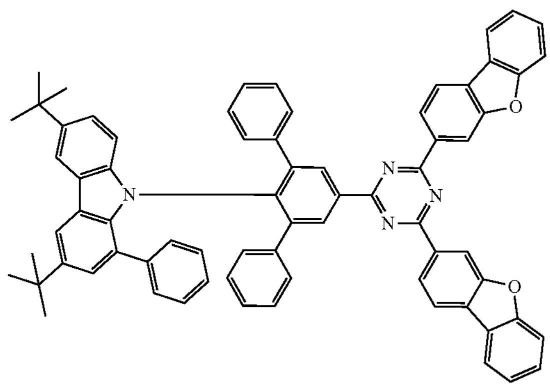
318
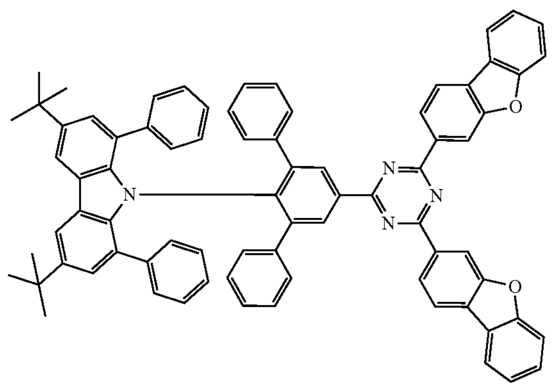
319
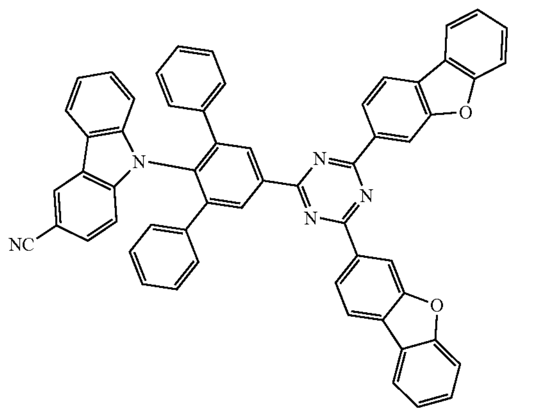
320
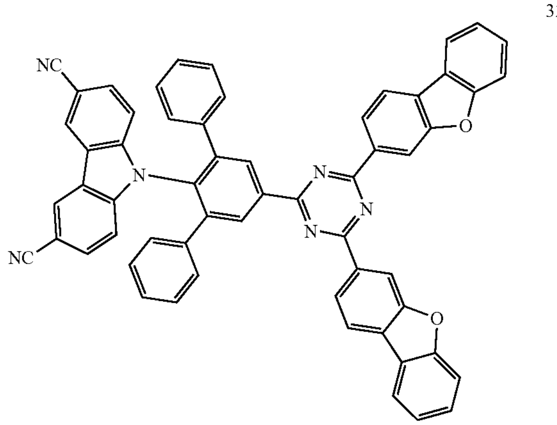

-continued
321
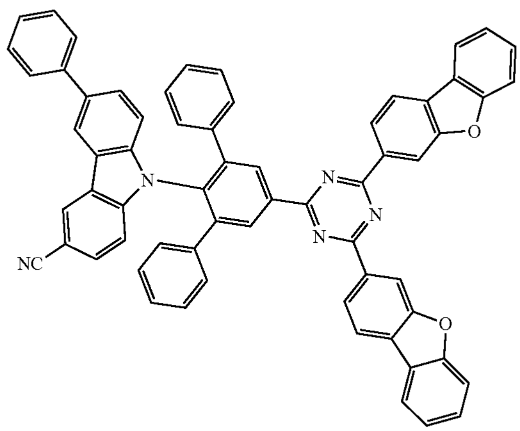
322
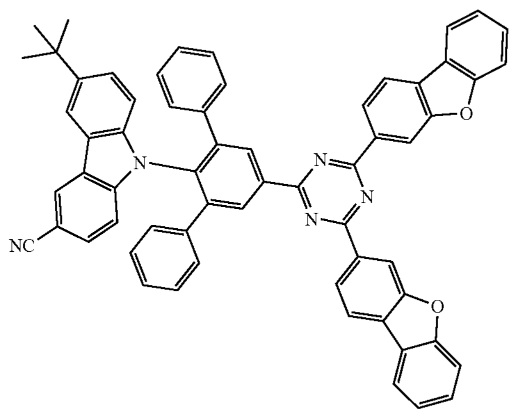
323
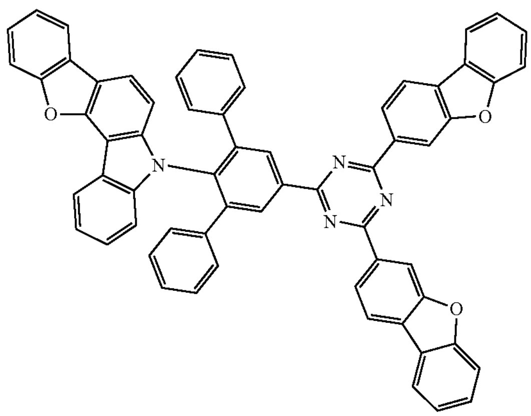
324
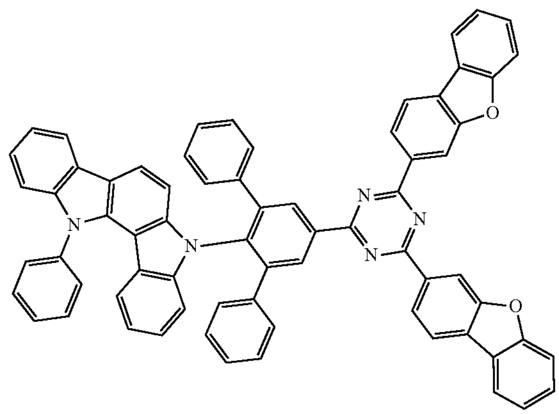
325
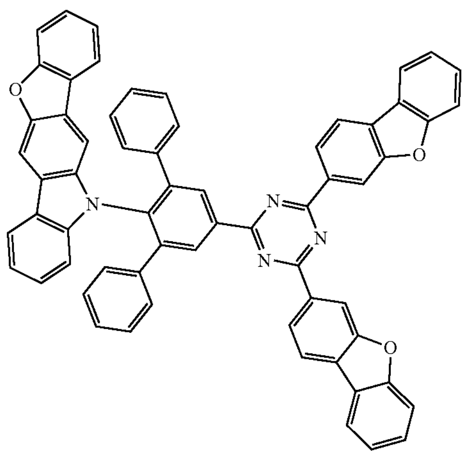
326
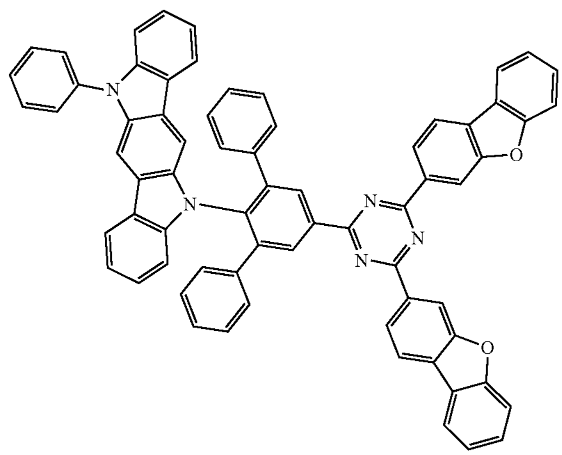

-continued
327
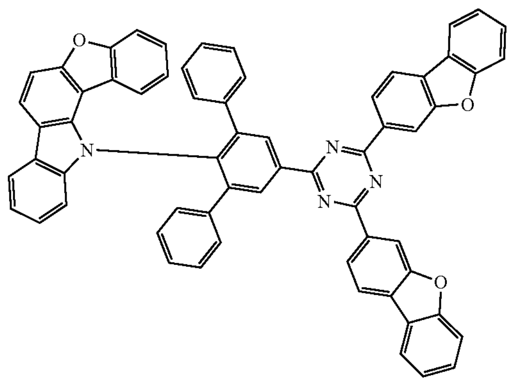
328
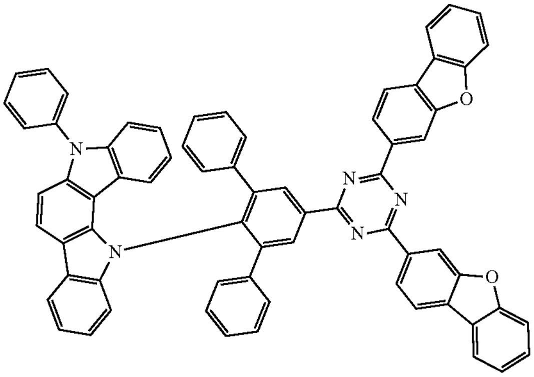
329
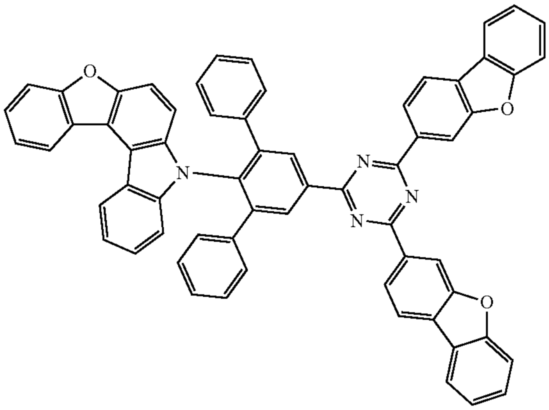
330
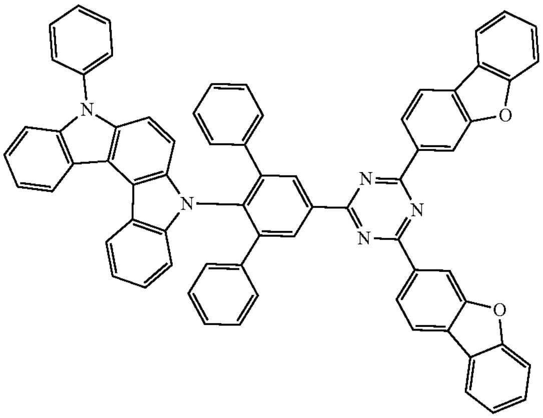
331
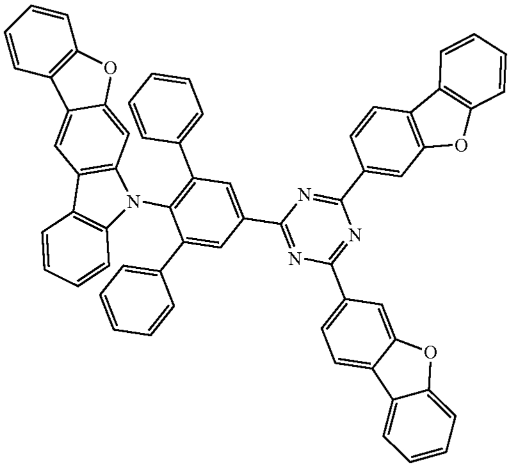
332
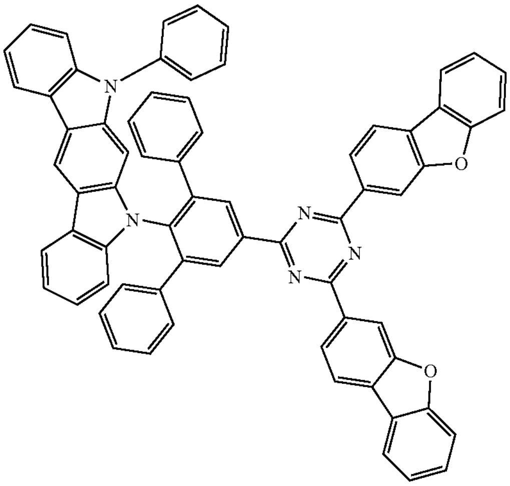

-continued
333
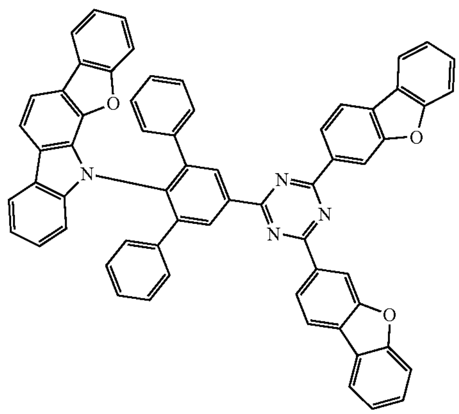
334
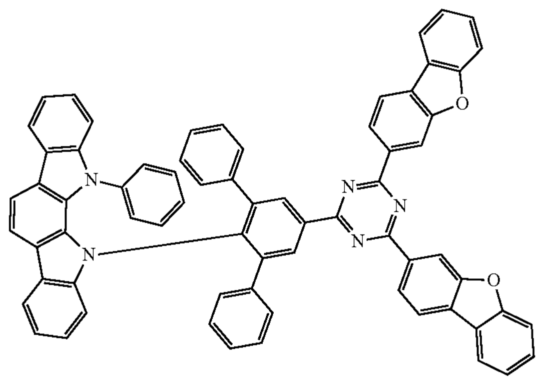
335
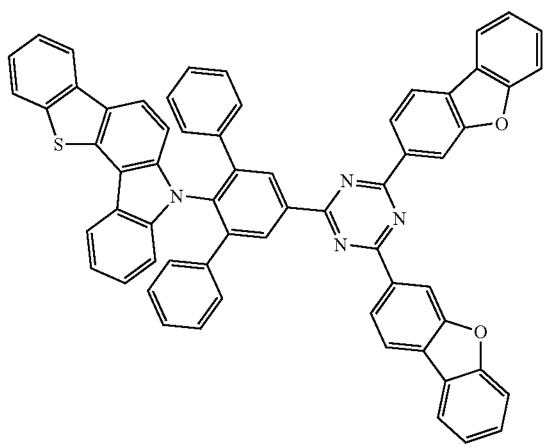
336
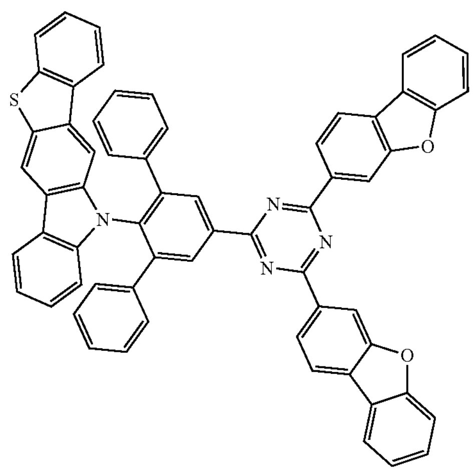
337
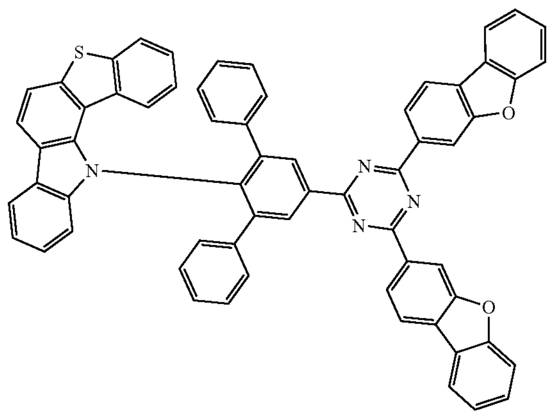
338
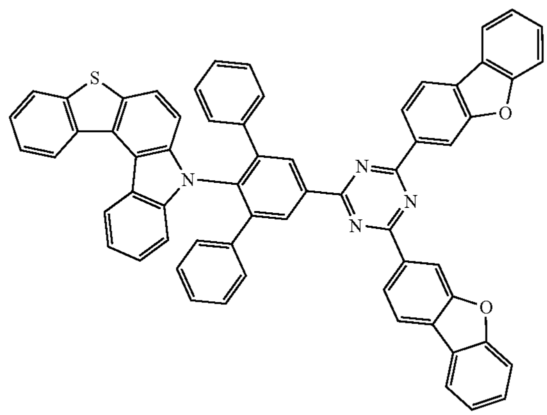

-continued
339
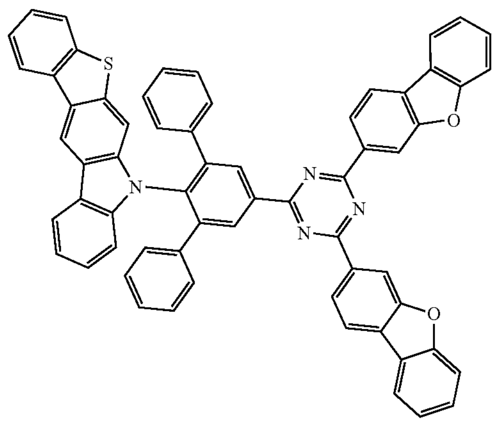
340
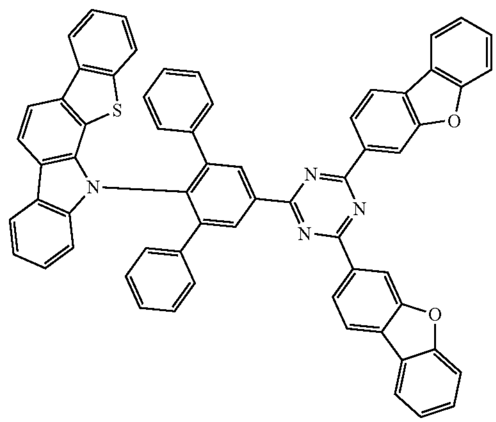
341
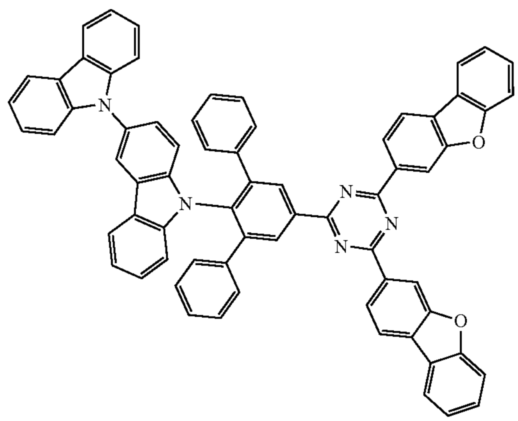
342
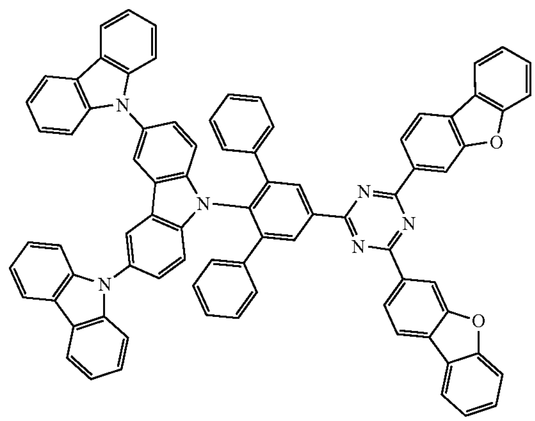
343
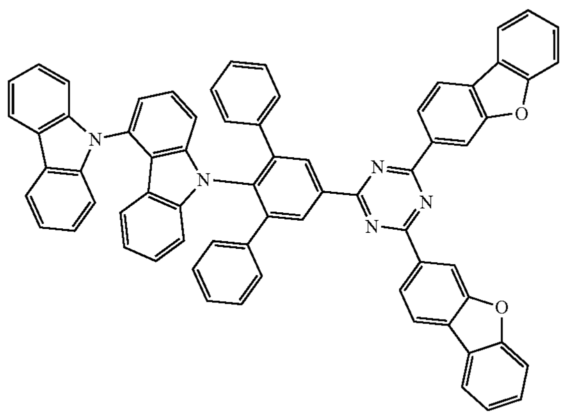
344
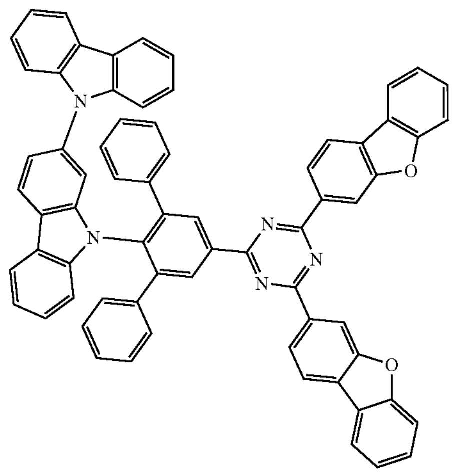

-continued
345
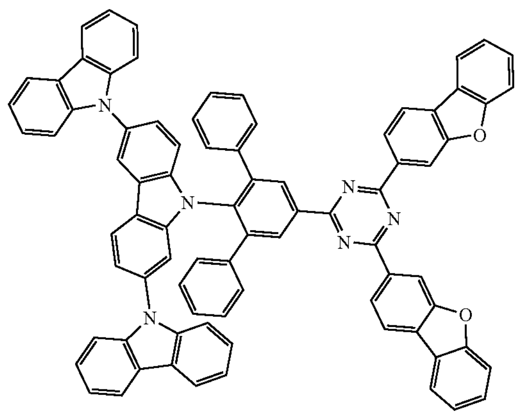
346
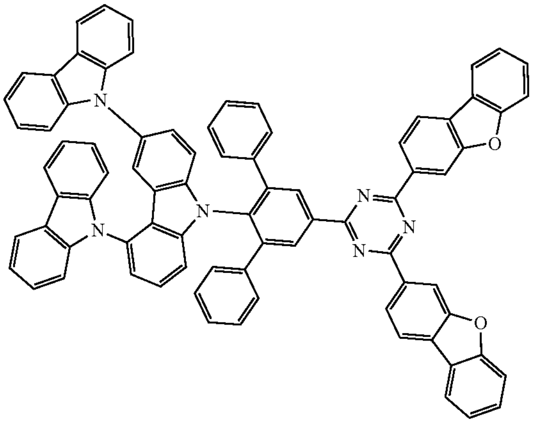
347
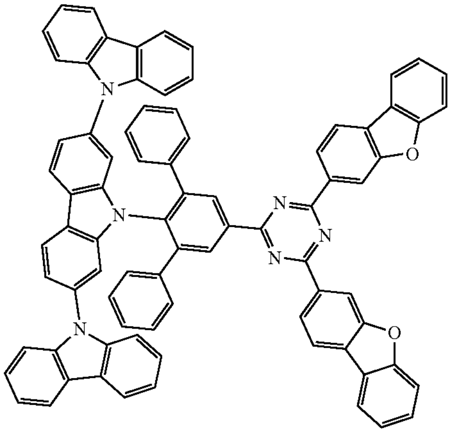
348
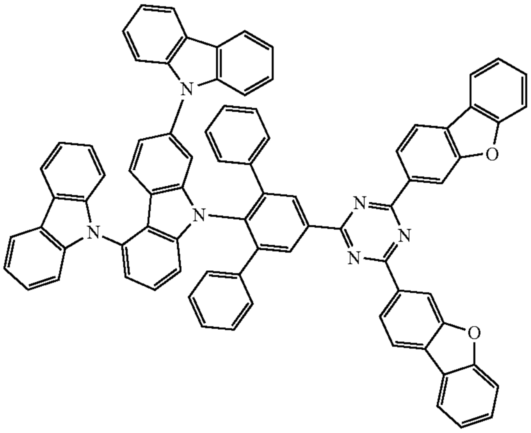
349
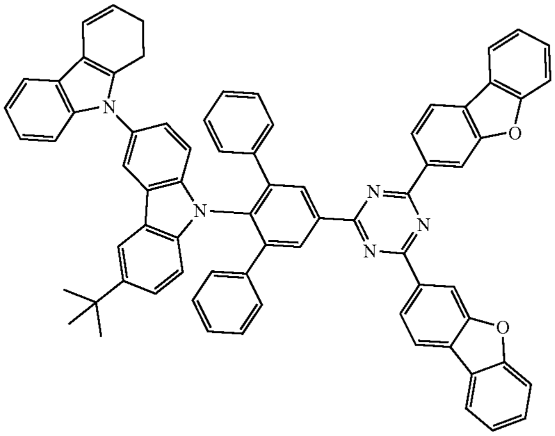
350
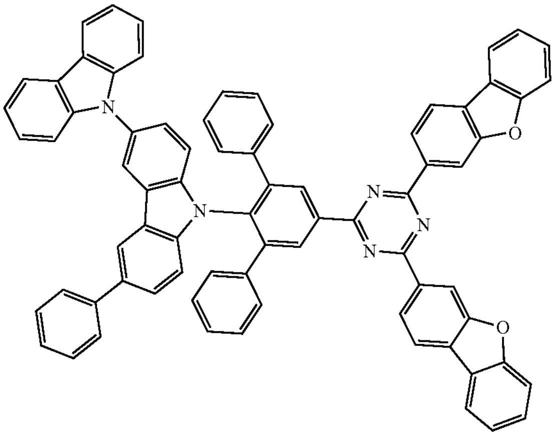

-continued
351
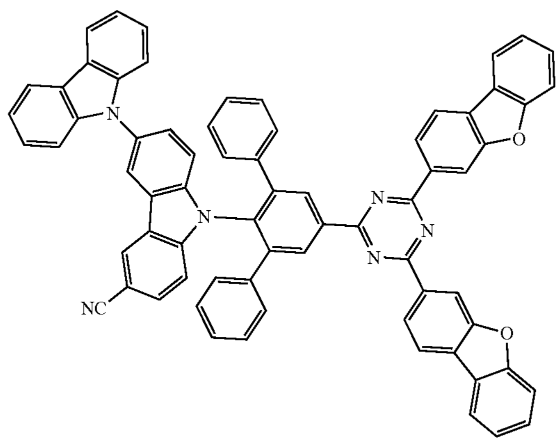
352
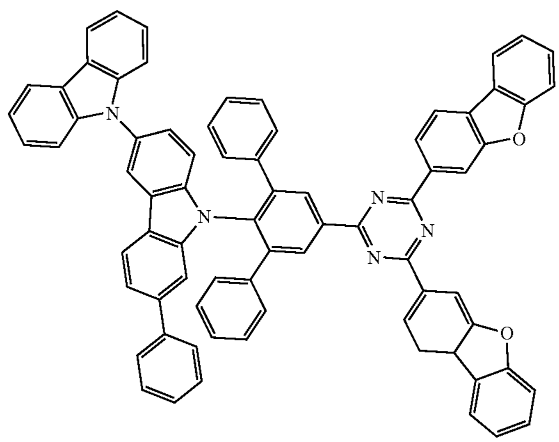
353
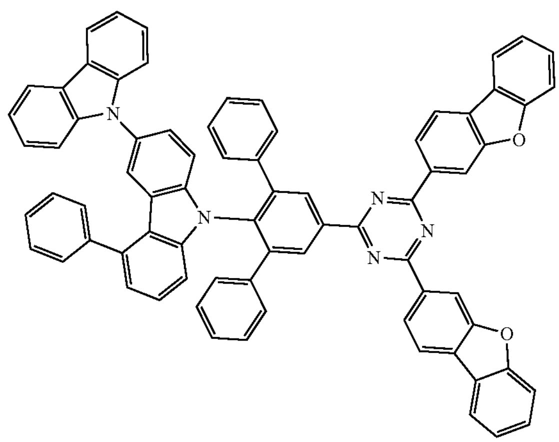
354
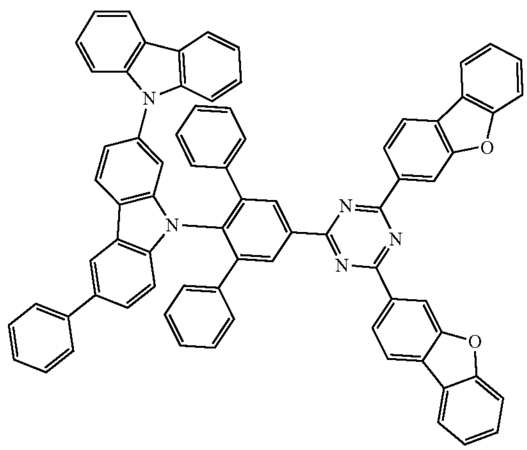
355
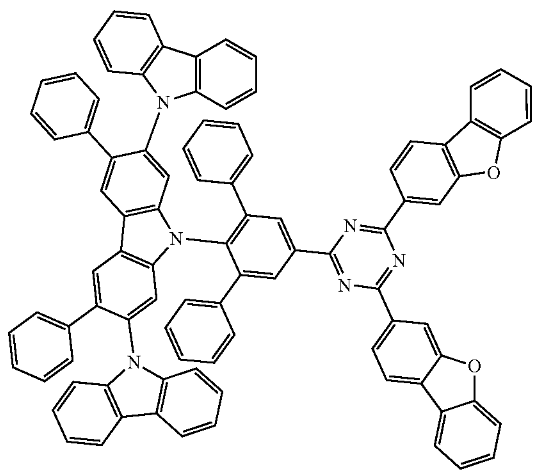
356
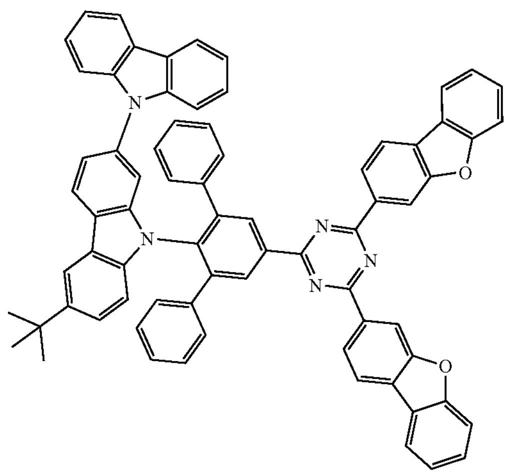

-continued
357
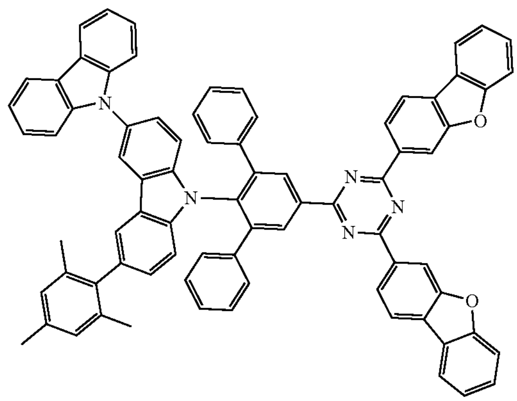
358
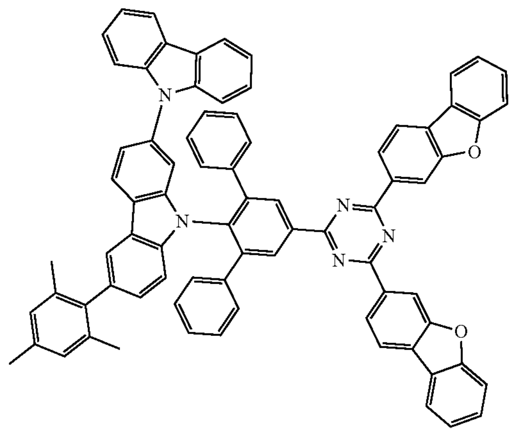
359
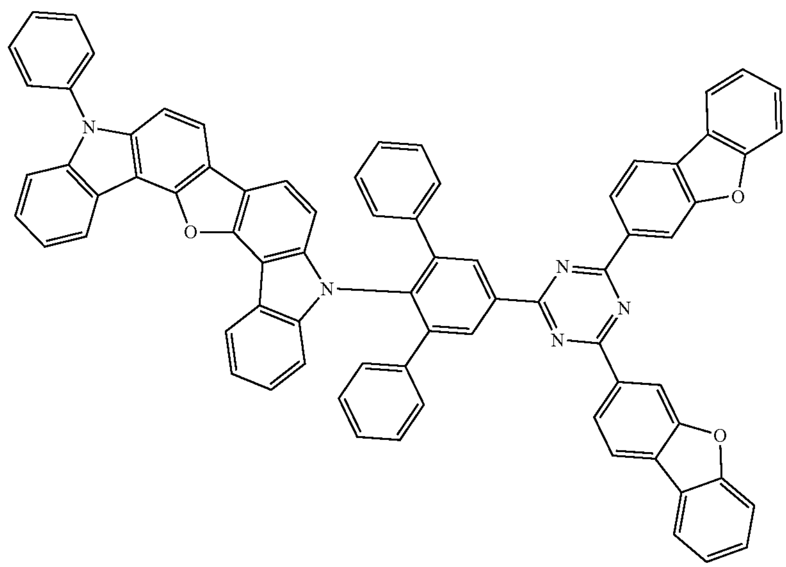
360
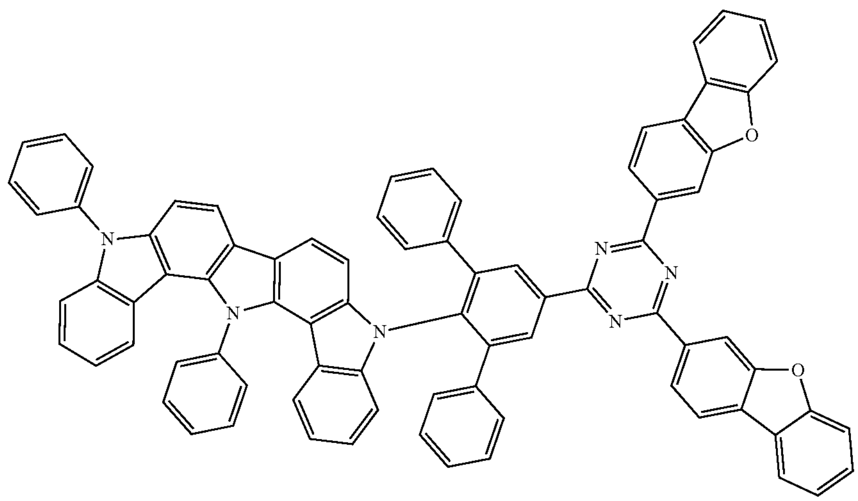

-continued
361
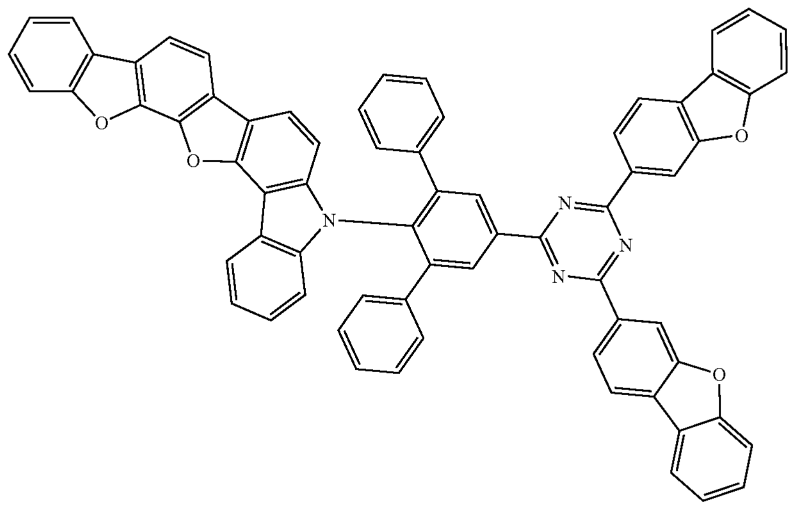
362
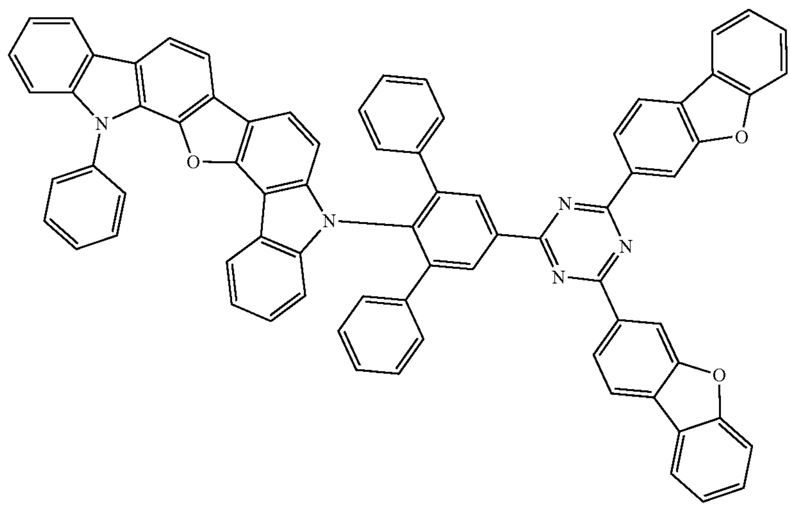
363
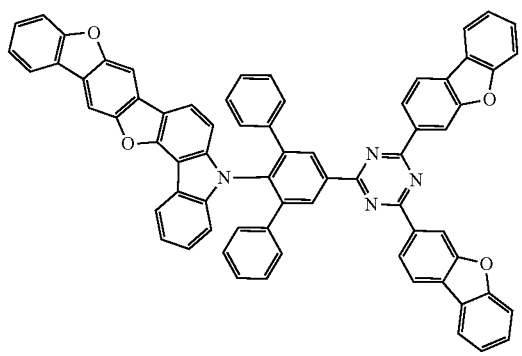
364
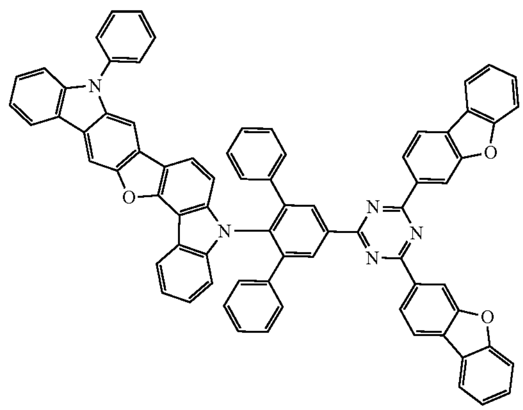

-continued
365
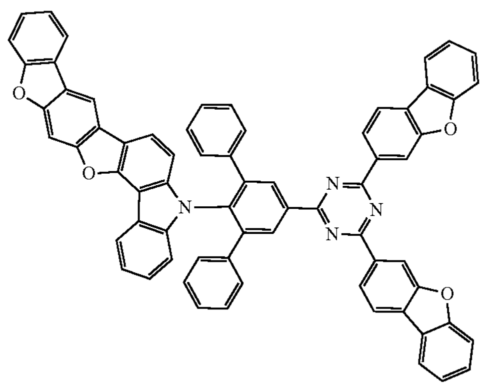
366
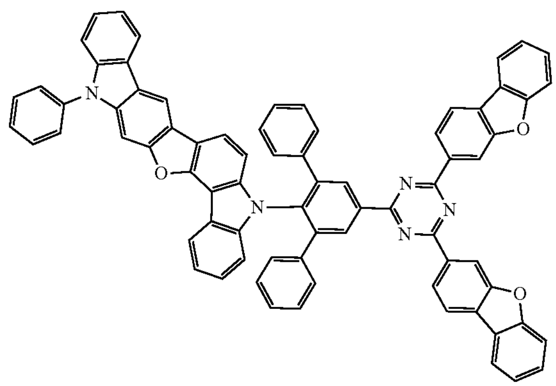
367
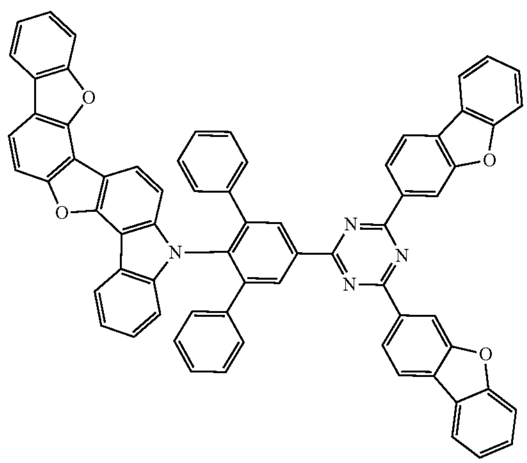
368
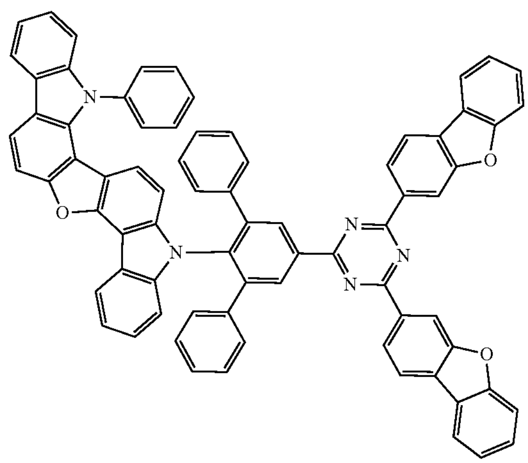
369
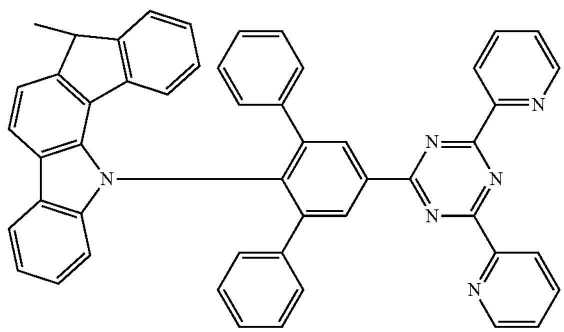

-continued
370
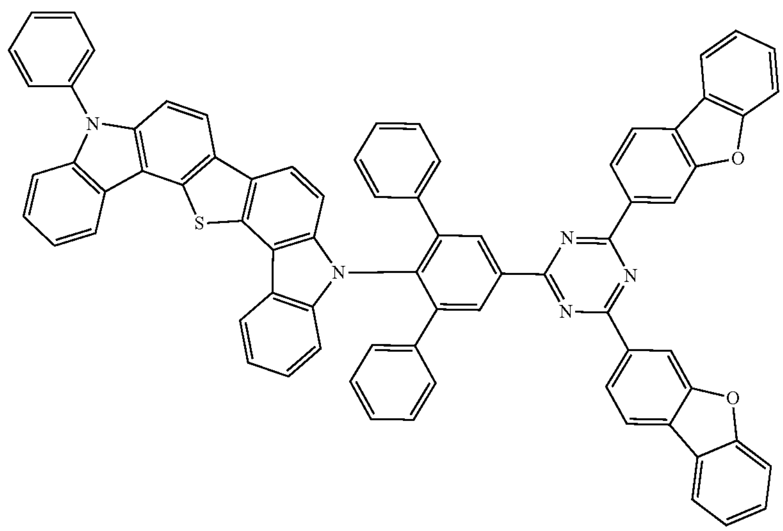
371
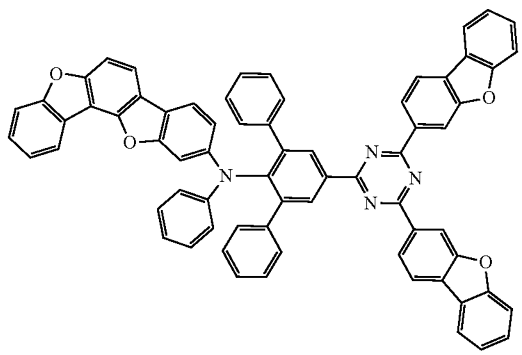
372
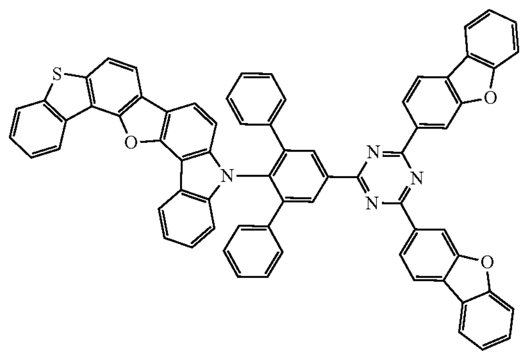
373
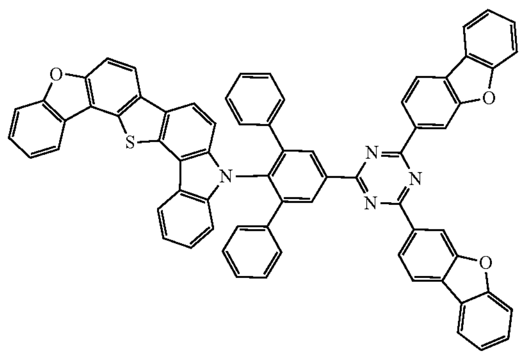
374
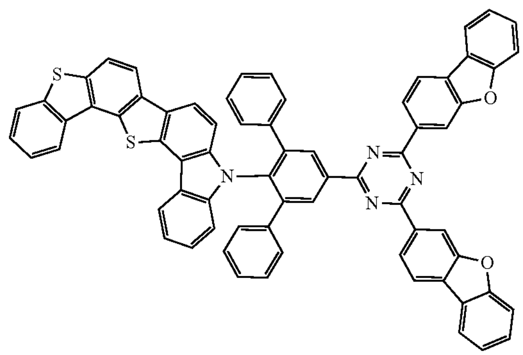
375
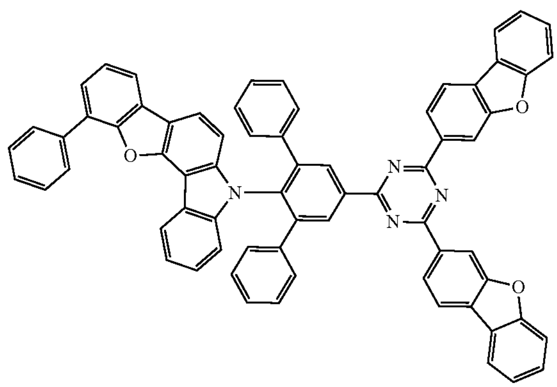
376
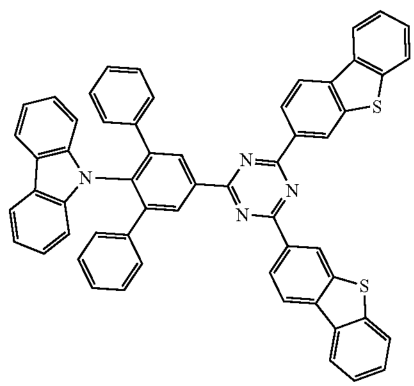

-continued
377
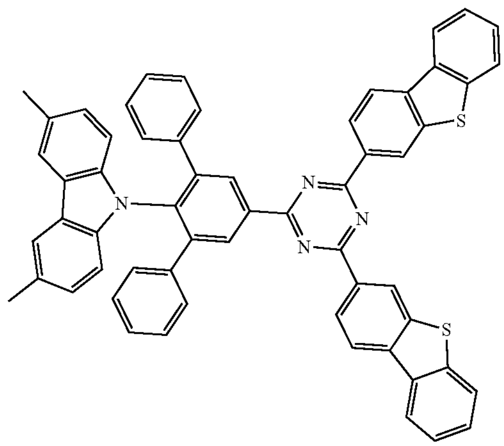
378
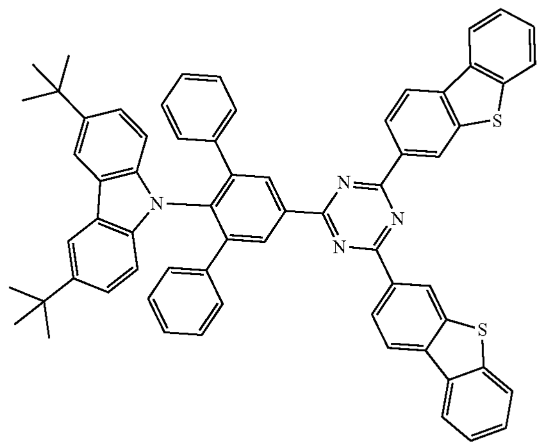
379
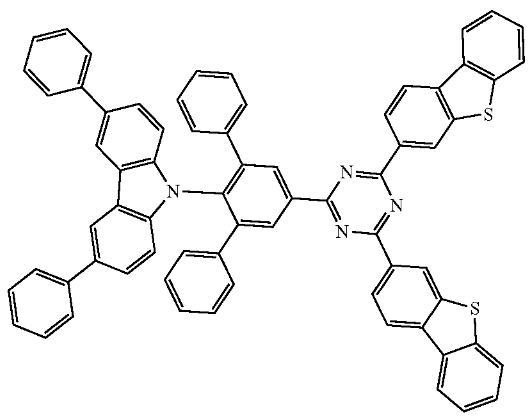
380
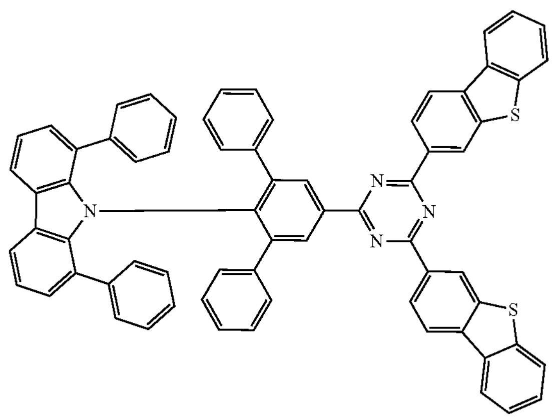
381
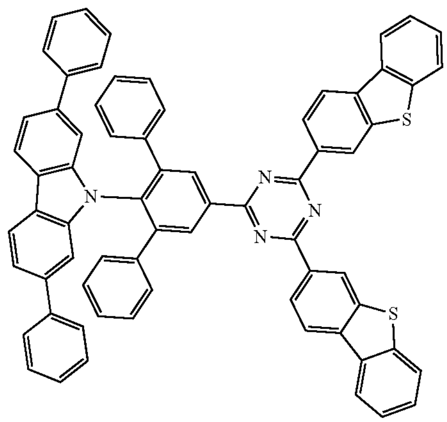
382
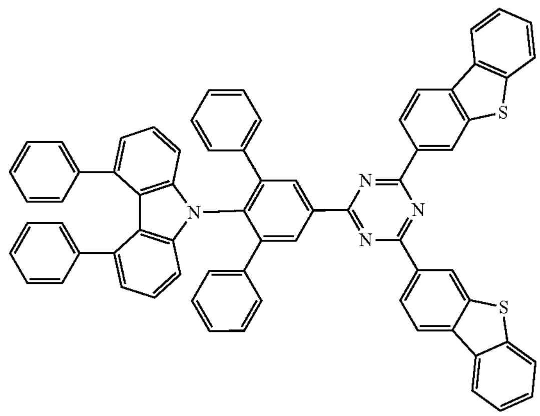

-continued
383
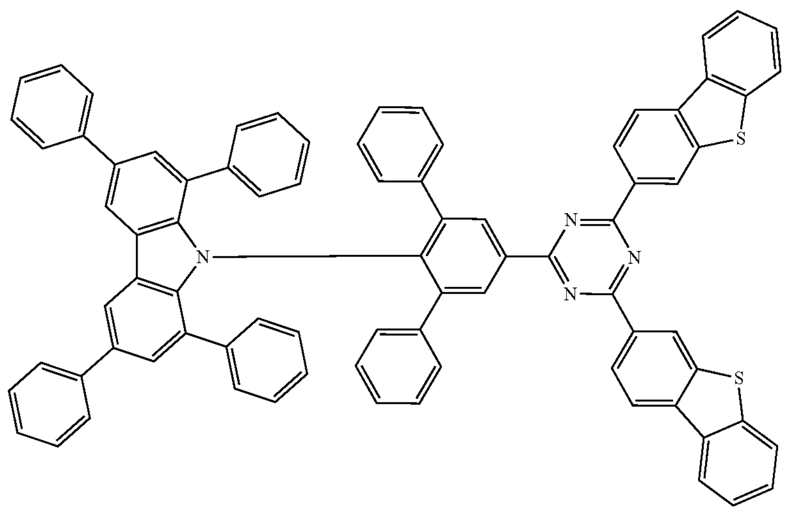
384
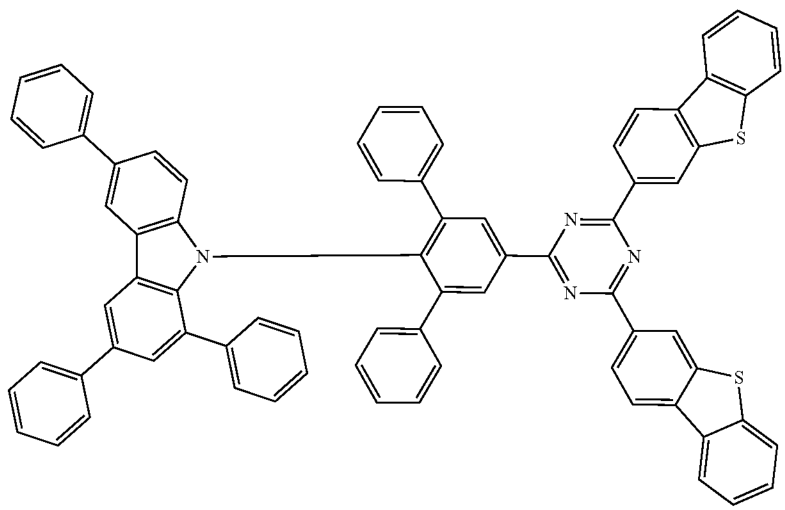
385
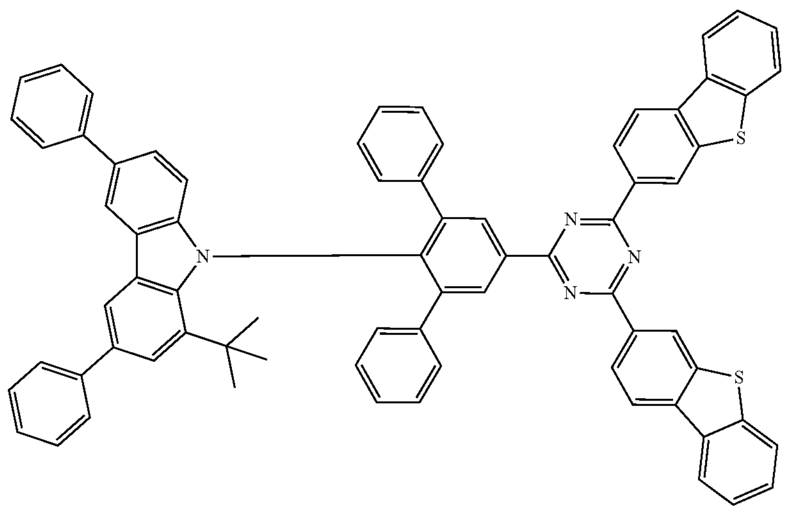

-continued
386
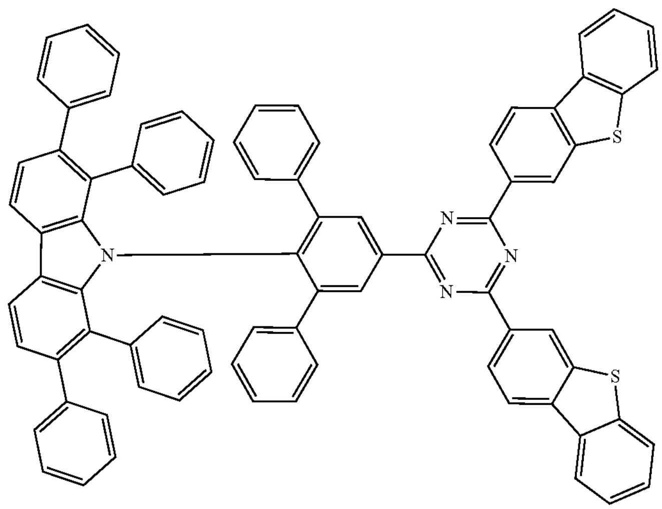
387
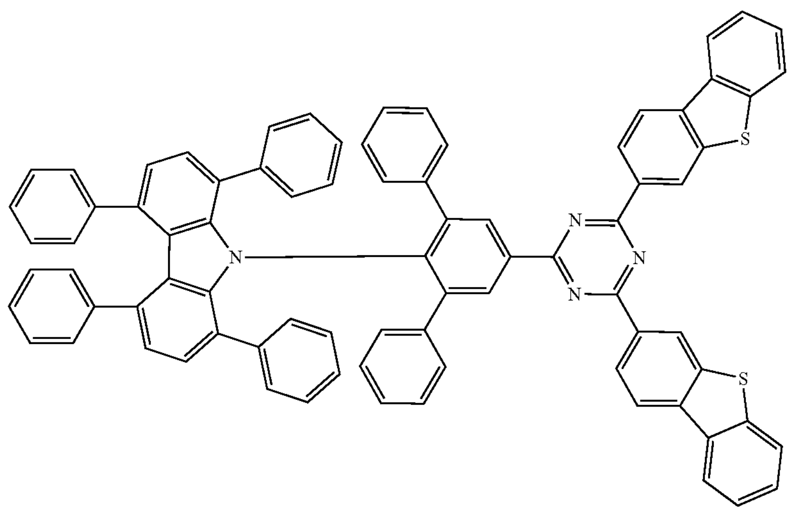
388
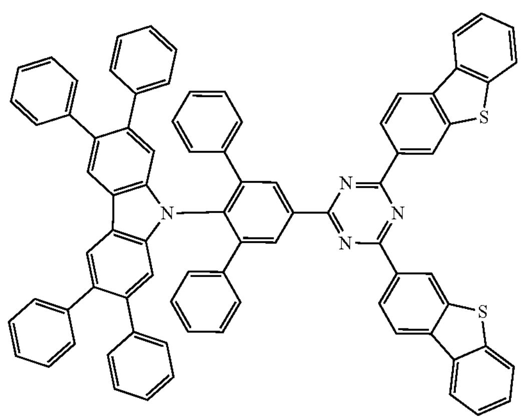
389
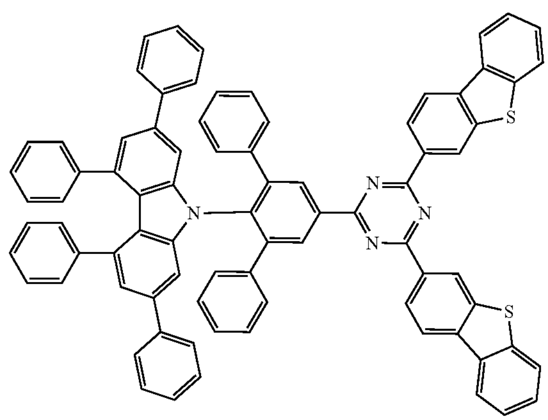

-continued
390
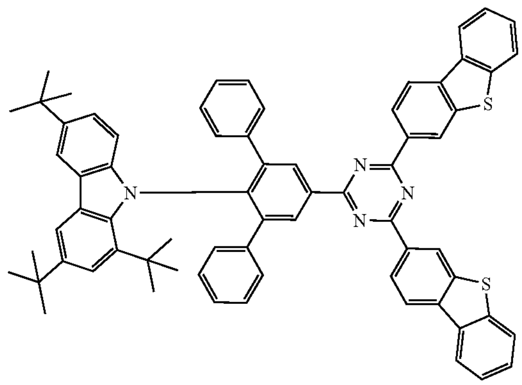
391
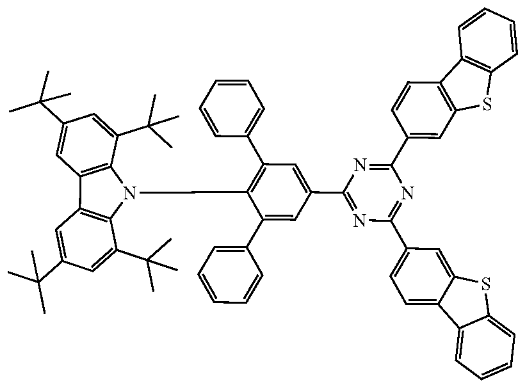
392
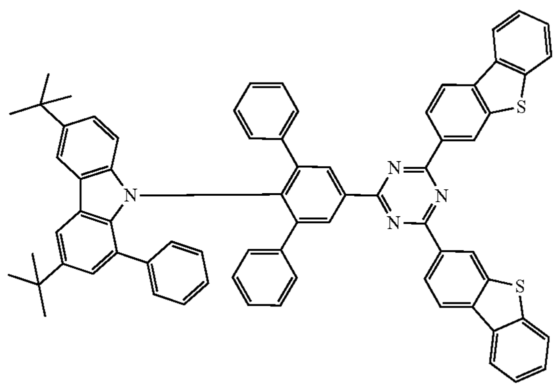
393
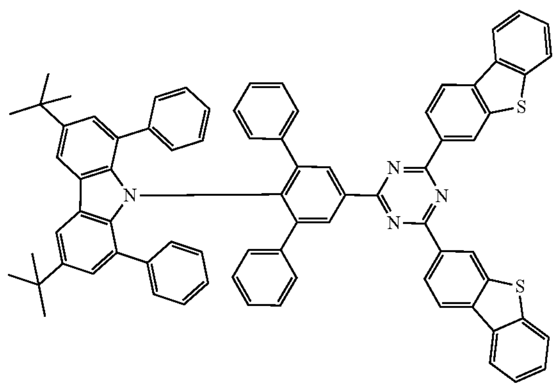
394
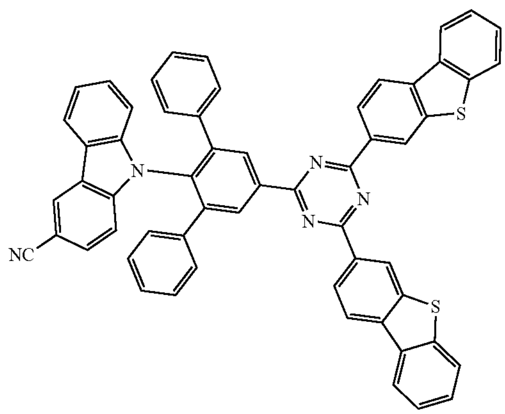
395
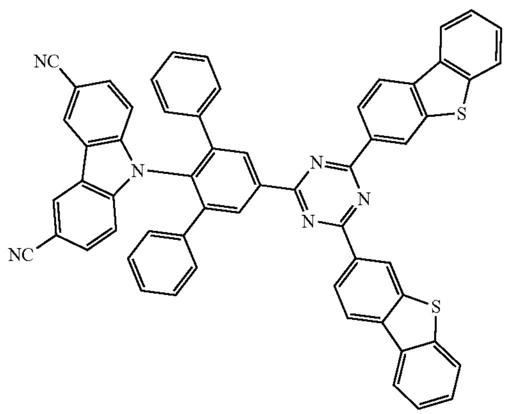
396
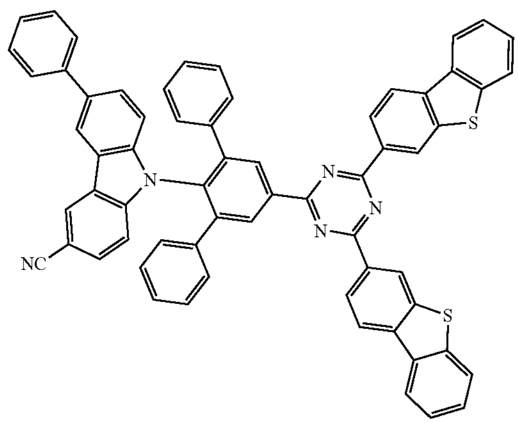
397
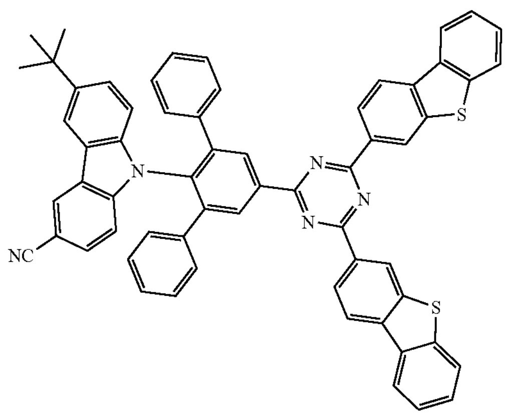

-continued
398
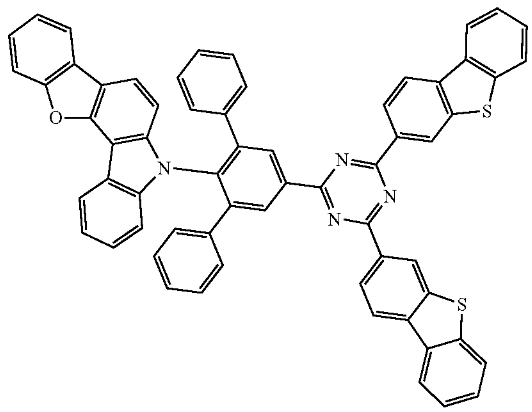
399
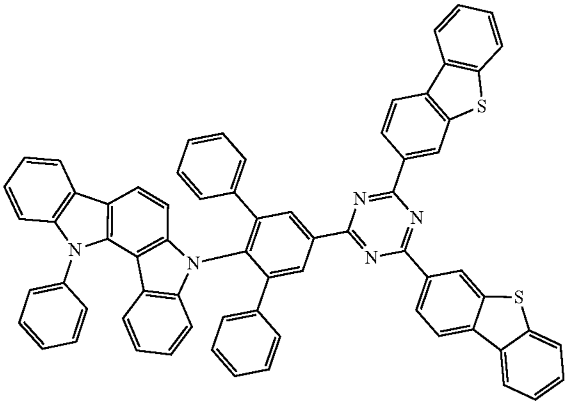
400
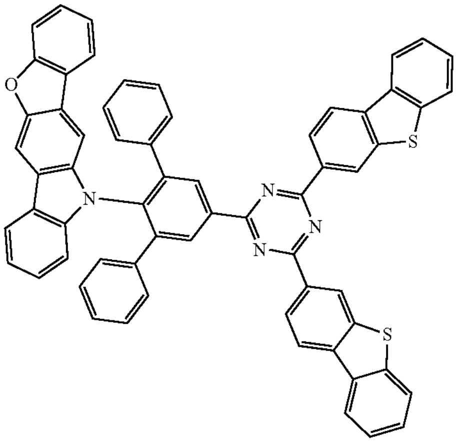
401
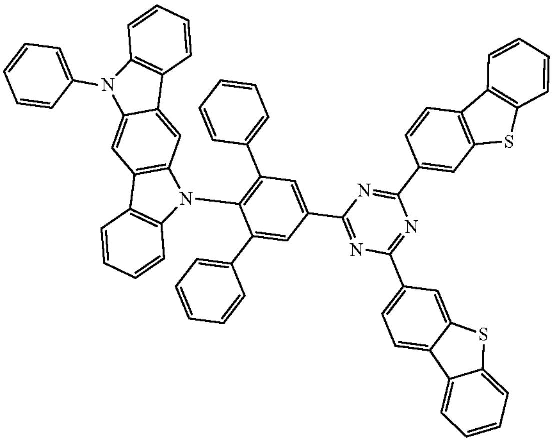
402
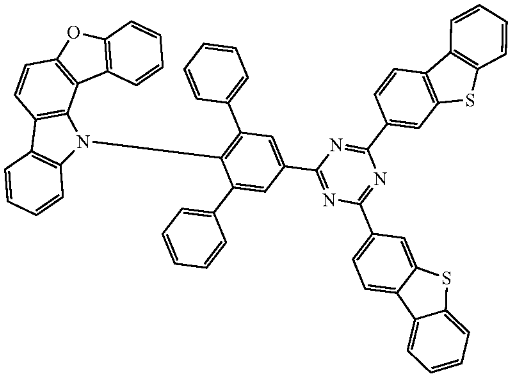
403
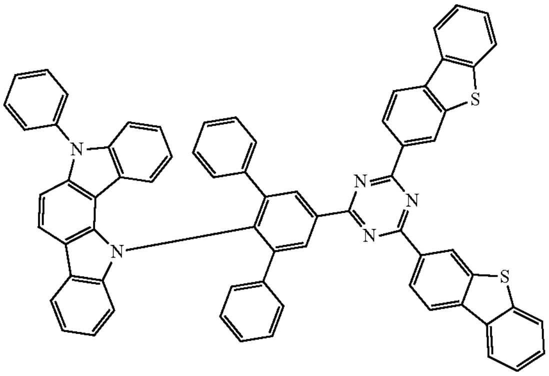

-continued
404
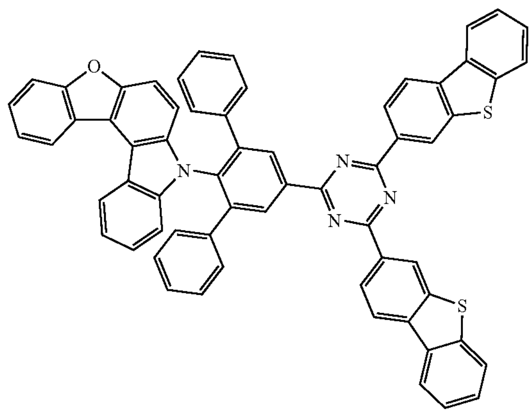
405
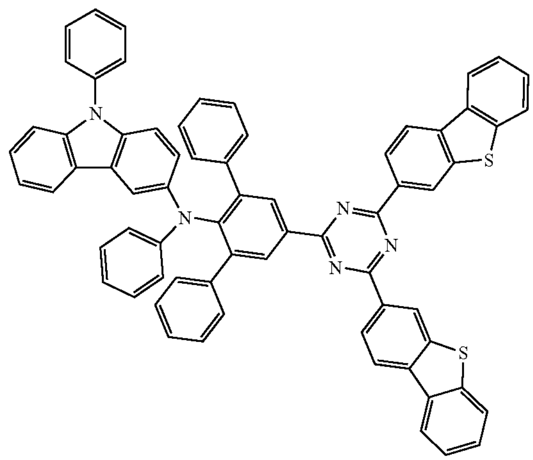
406
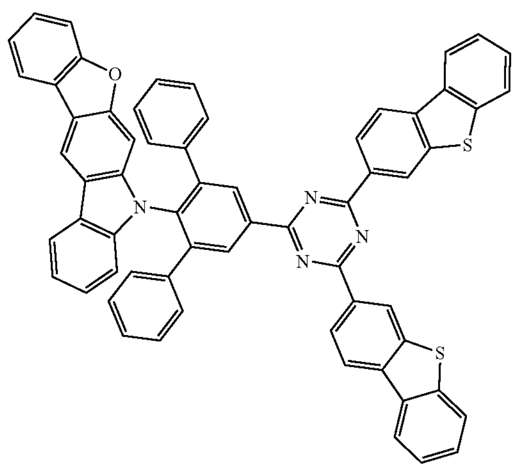
407
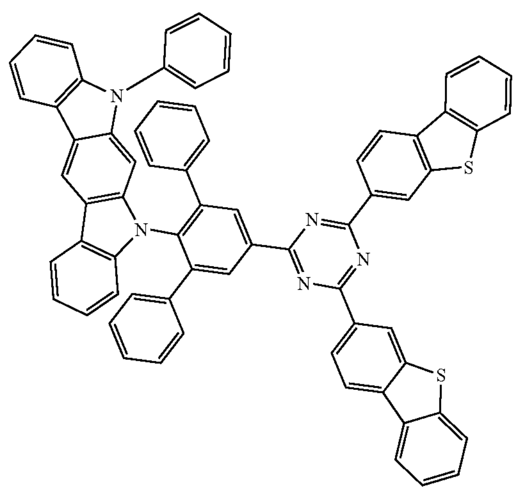
408
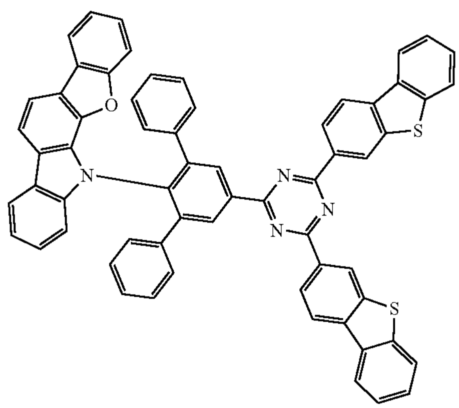
409
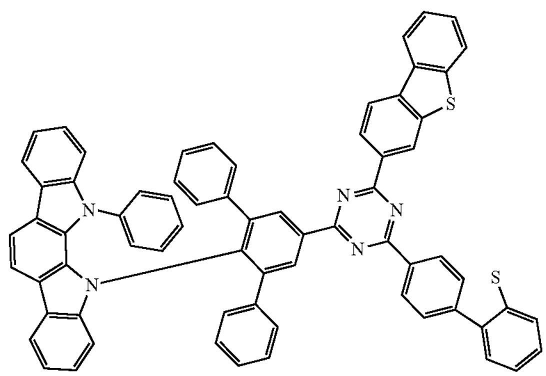

-continued
410
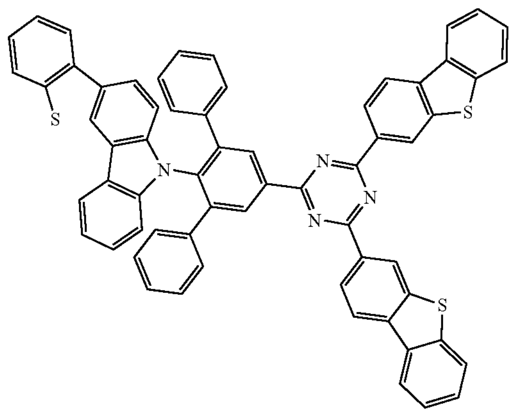
411
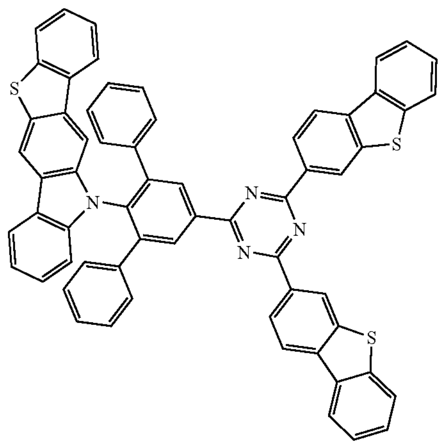
412
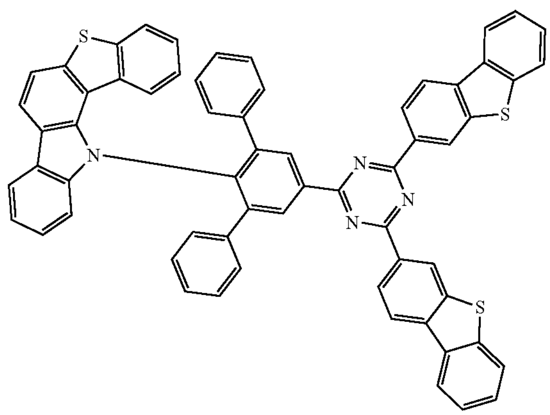
413
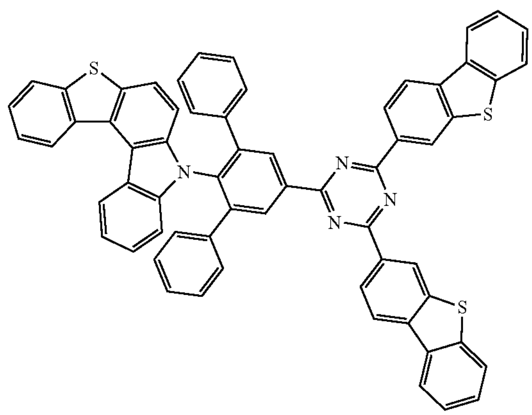
414
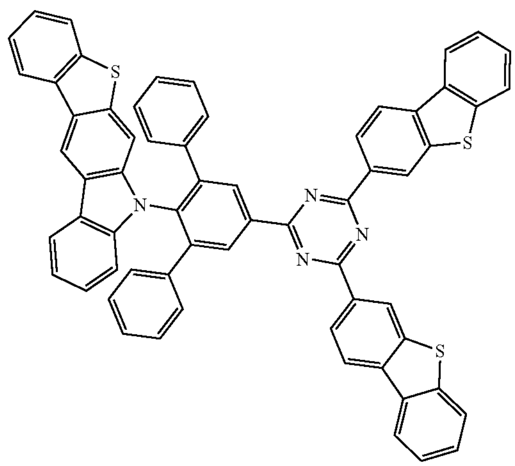
415
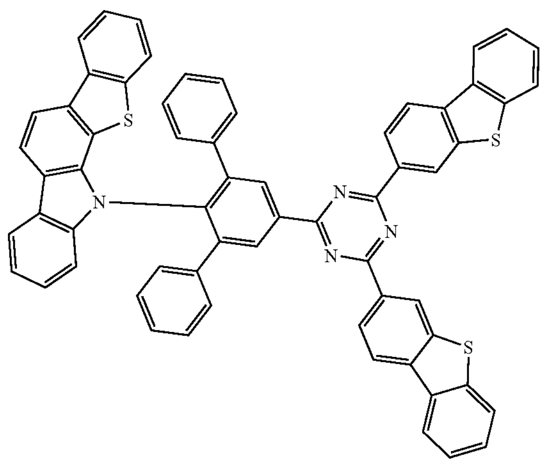

-continued
416
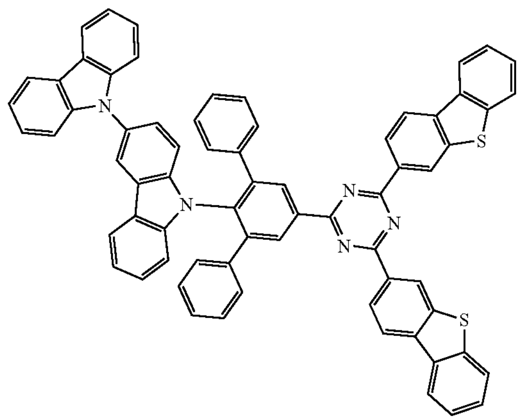
417
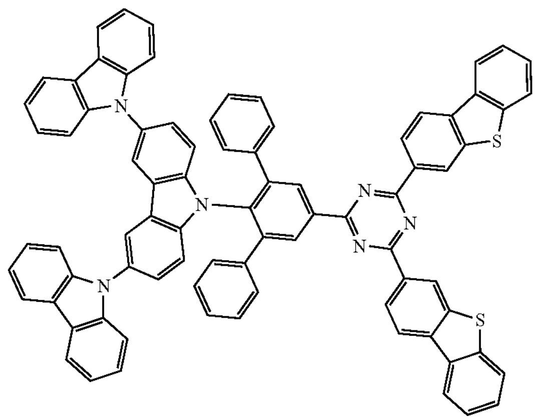
418
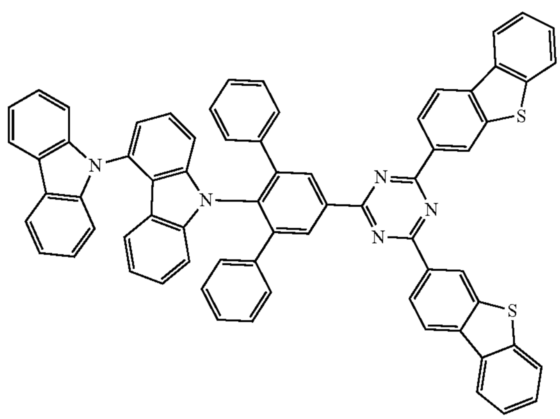
419
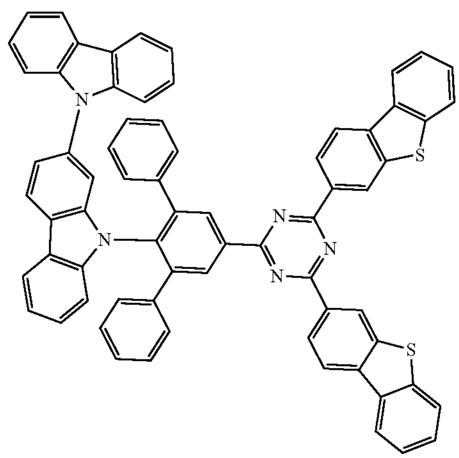
420
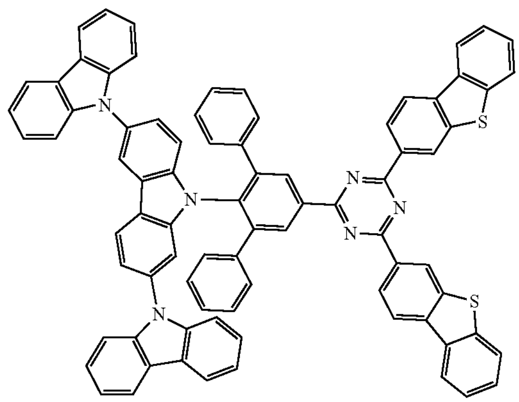
421
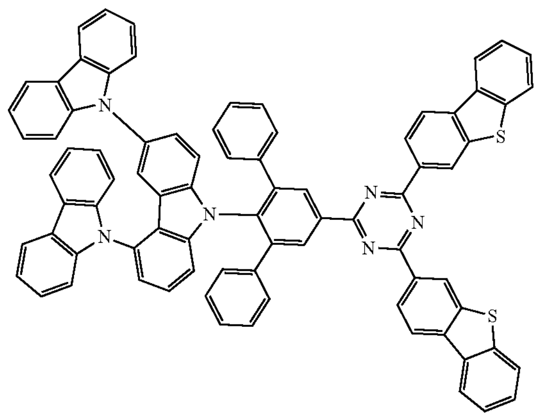

-continued
422
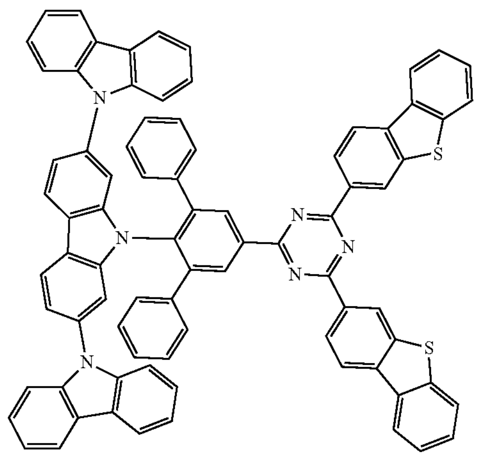
423
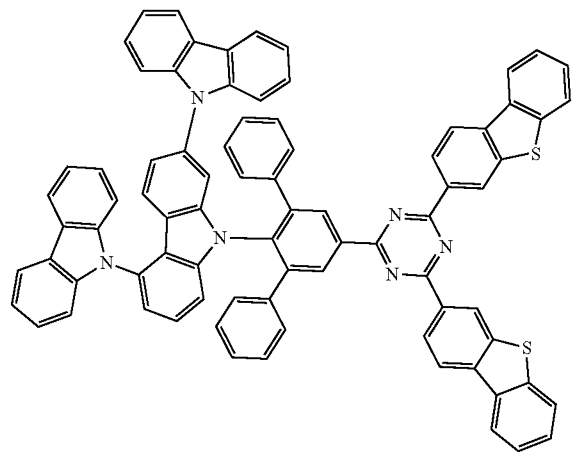
424
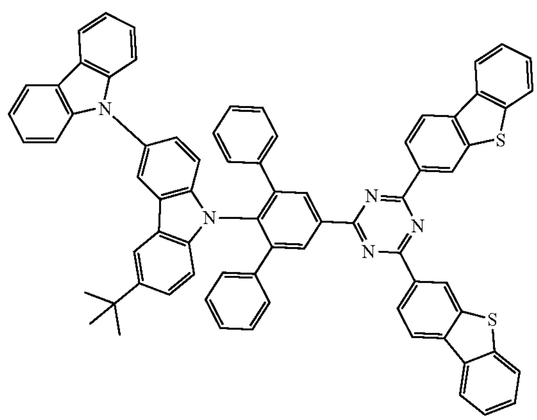
425
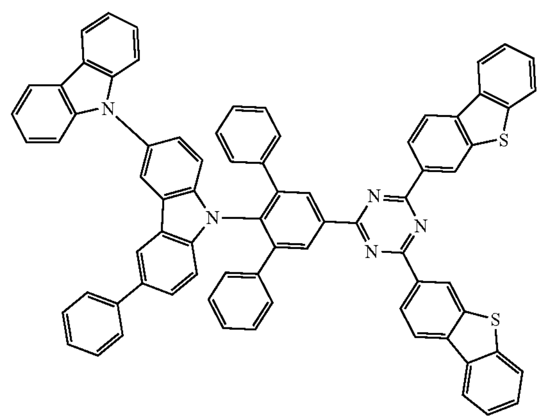
426
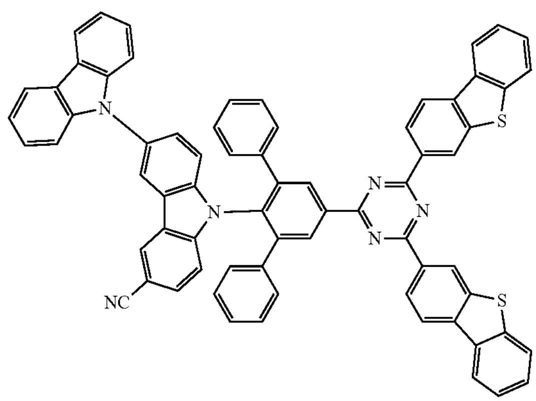
427
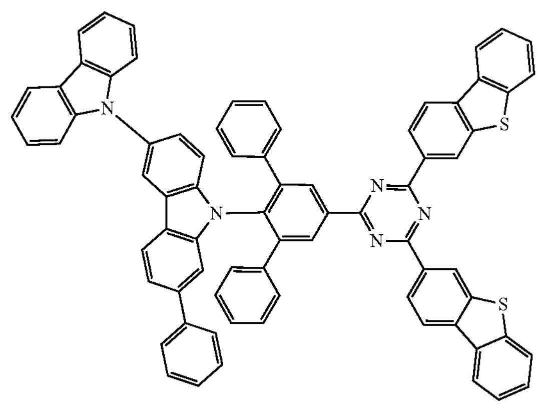

-continued
428
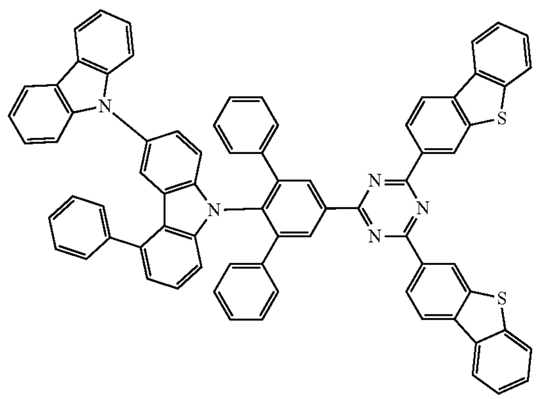
429
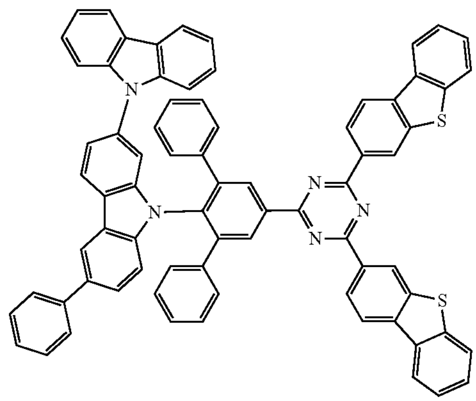
430
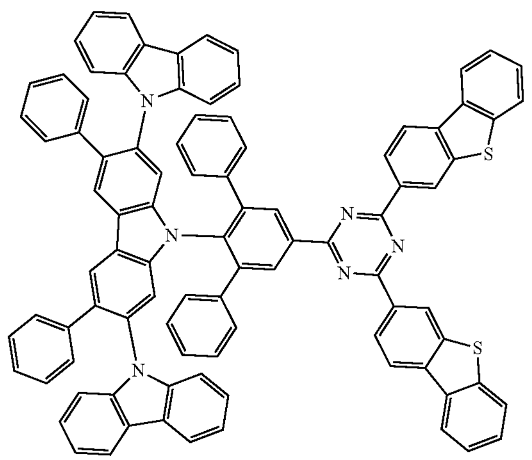
431
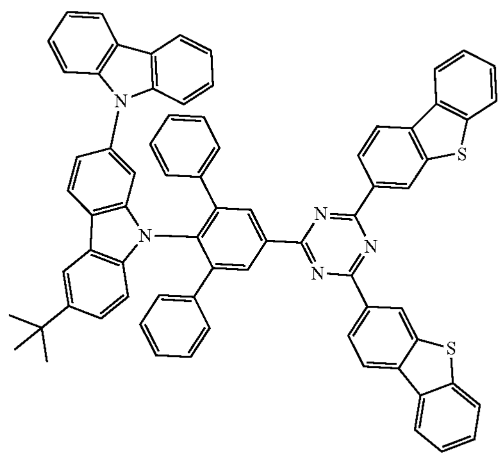
432
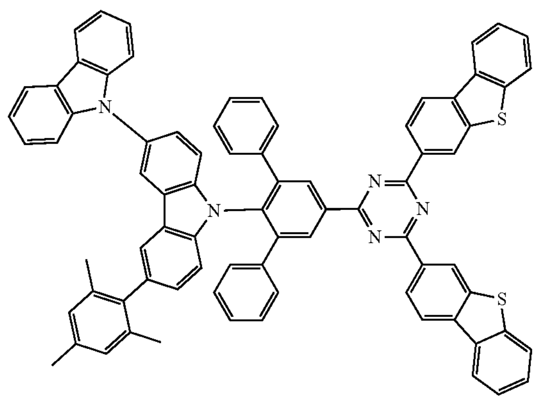
433
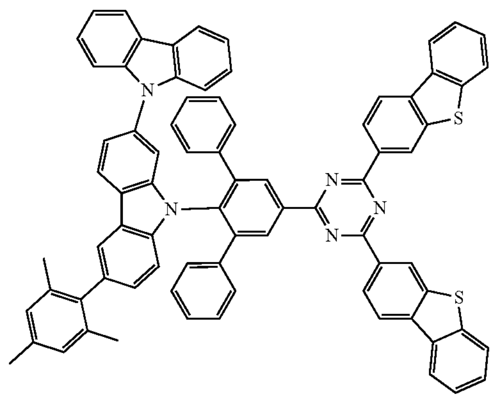

-continued
434
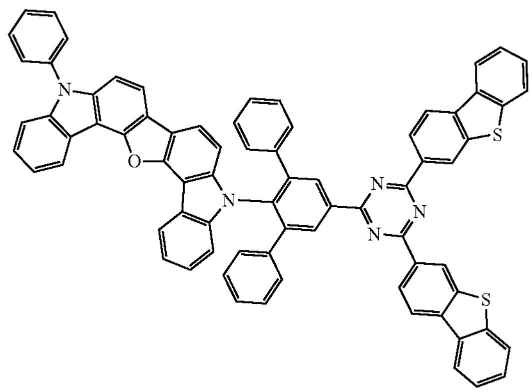
435
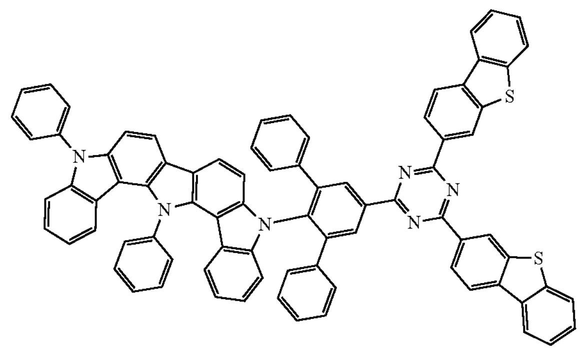
436
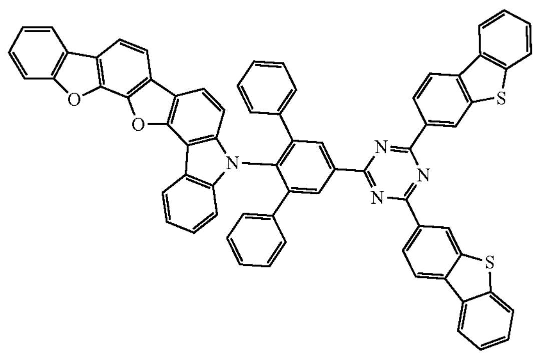
437
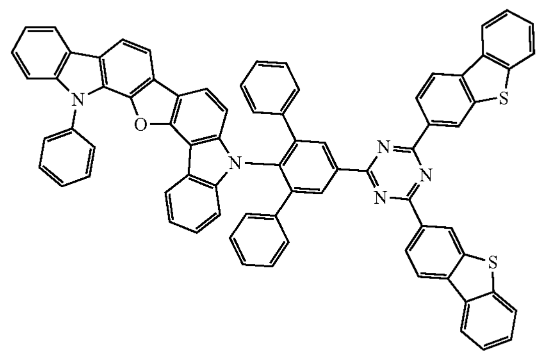
438
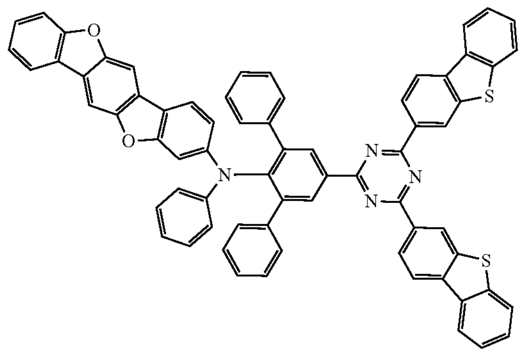
439
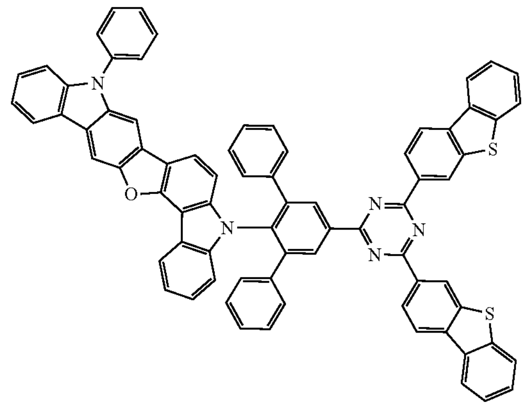

-continued
440
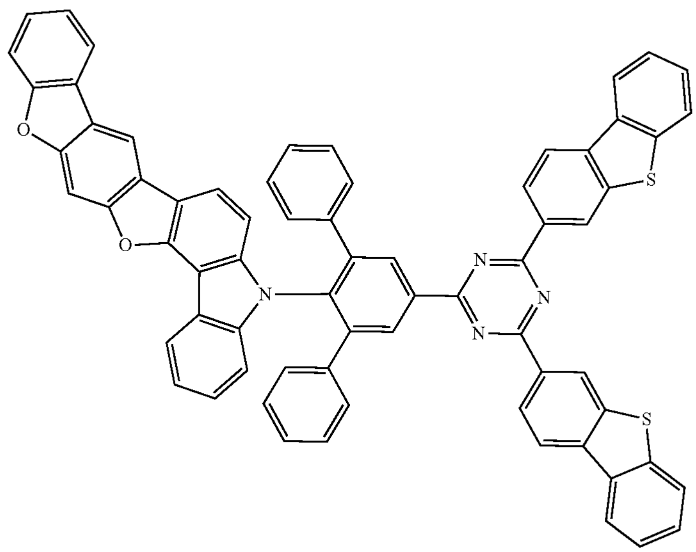
441
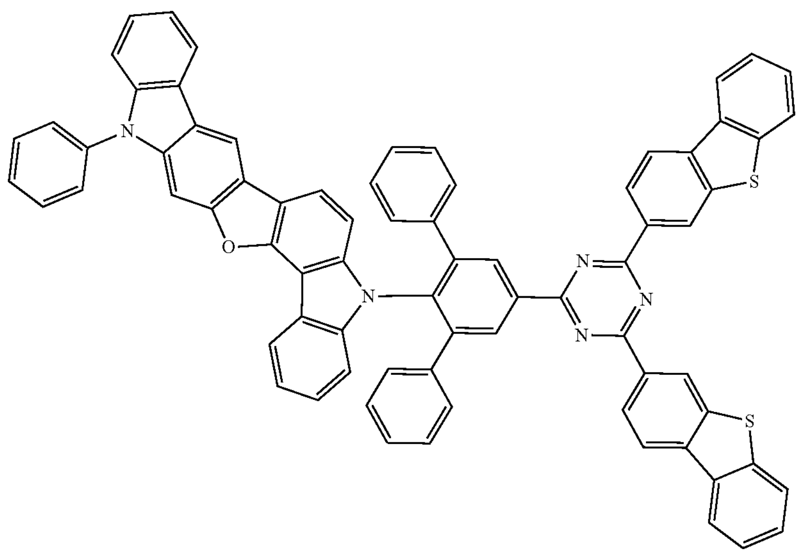
442
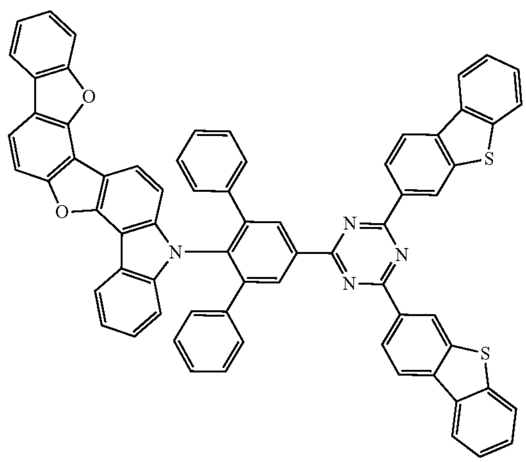
443
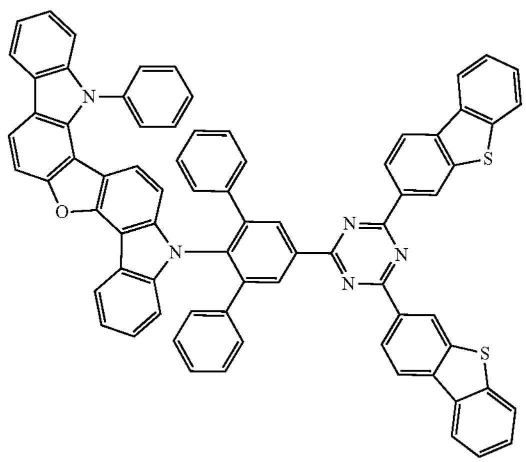

-continued
444
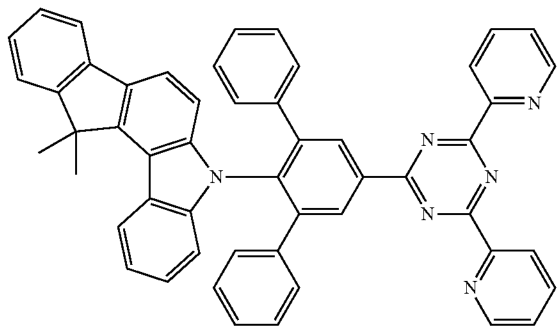
445
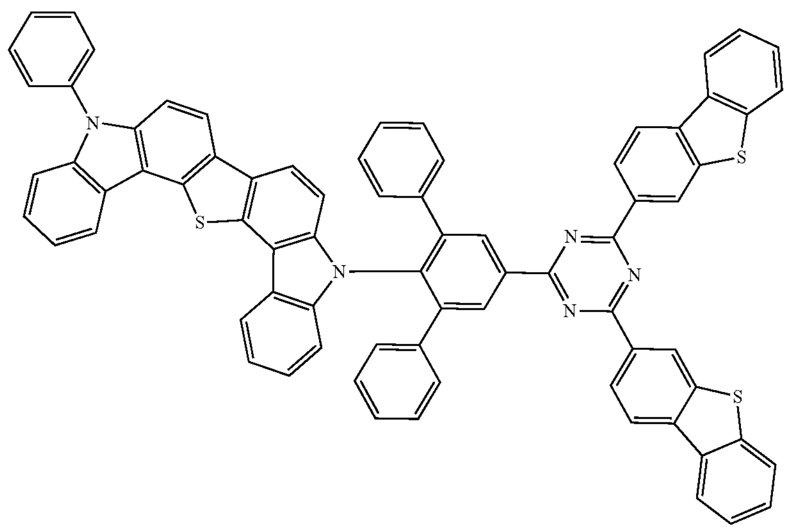
446
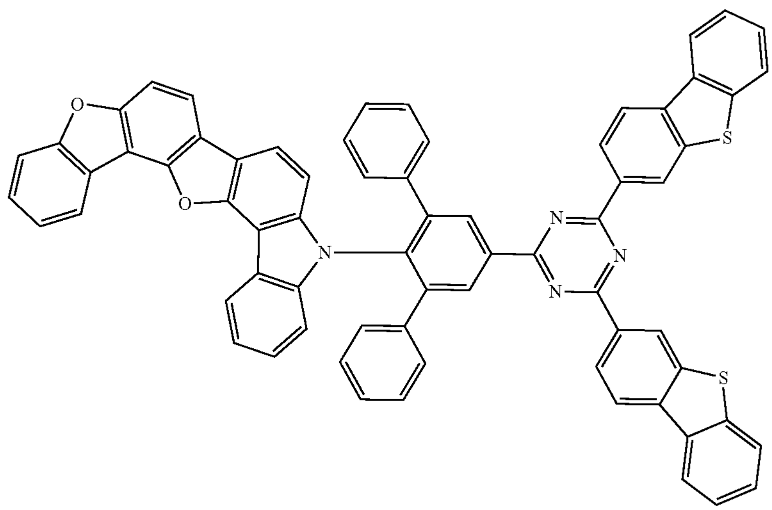

-continued
447
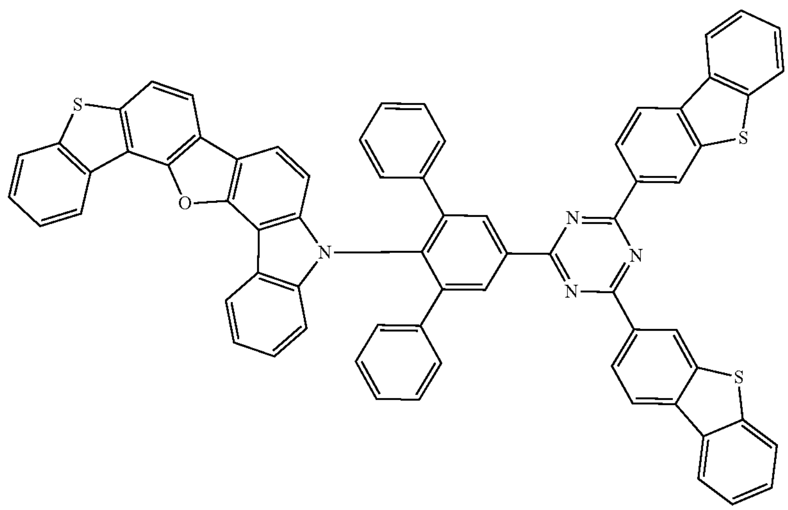
448
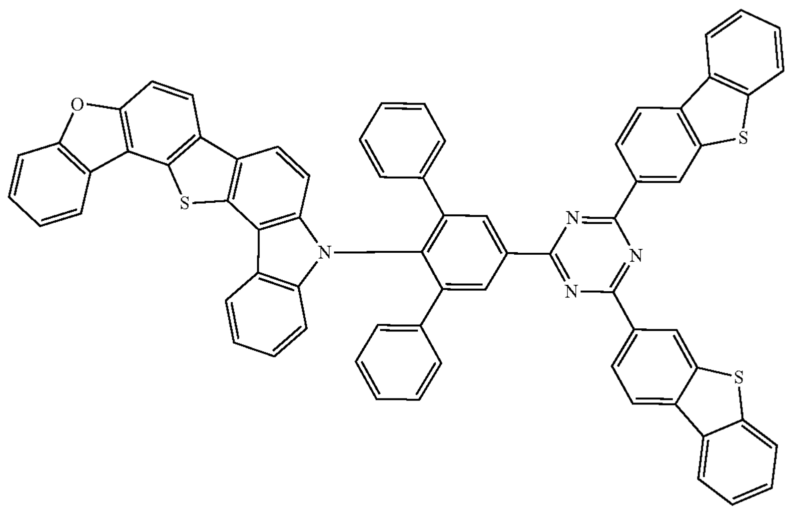
449
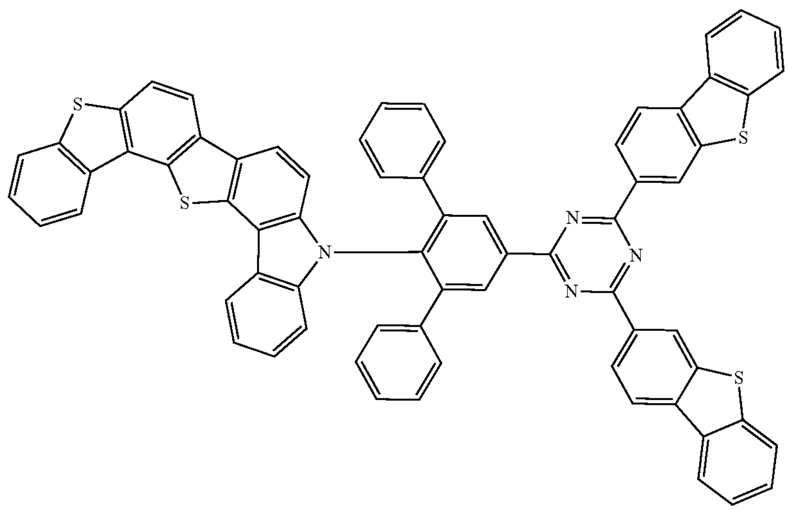

-continued
450
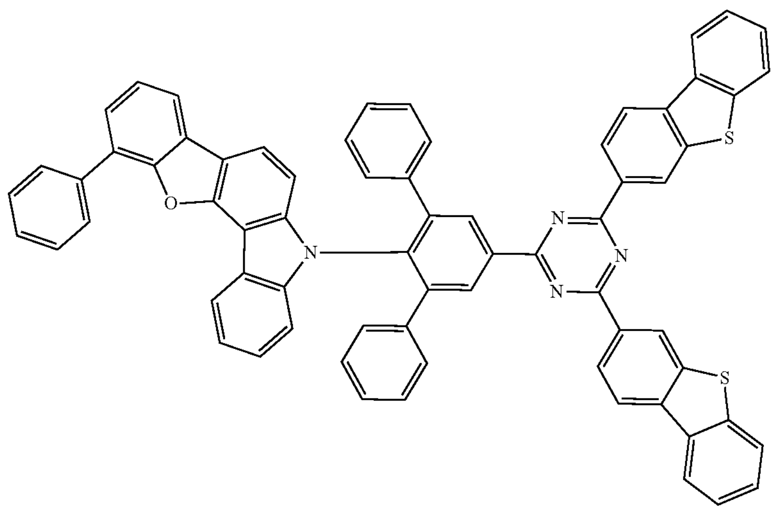
451
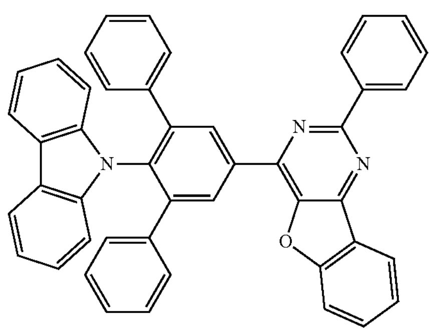
452
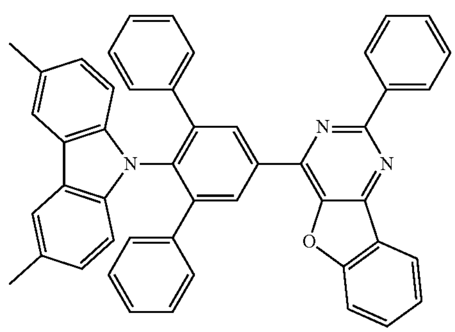
453
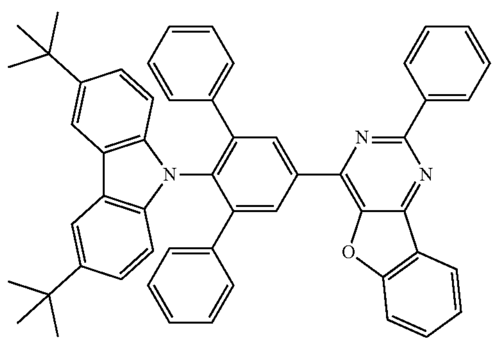
454
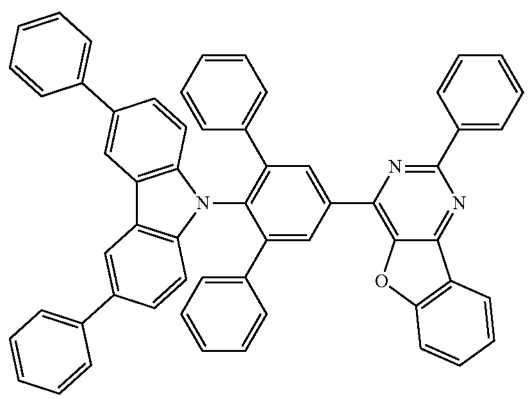

-continued
455
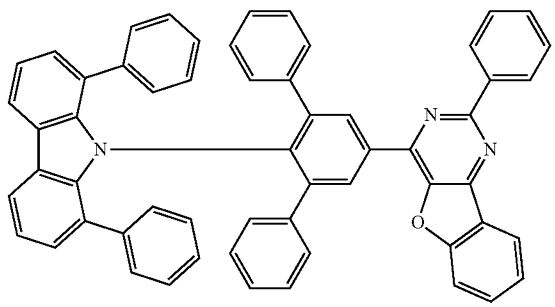
456
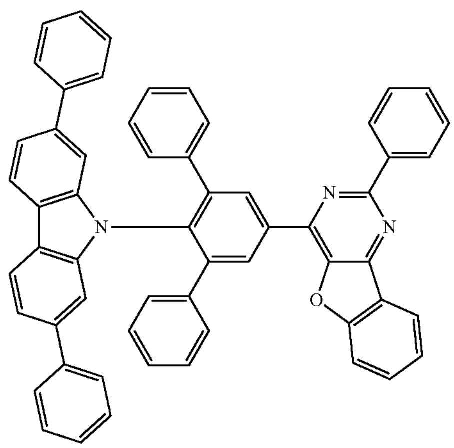
457
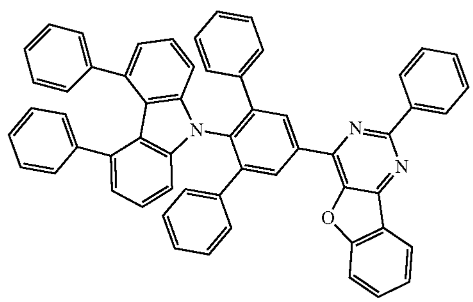
458
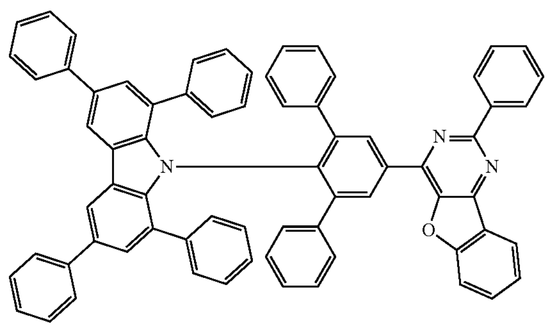
459
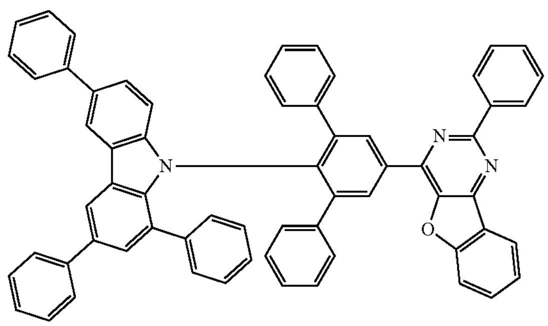
460
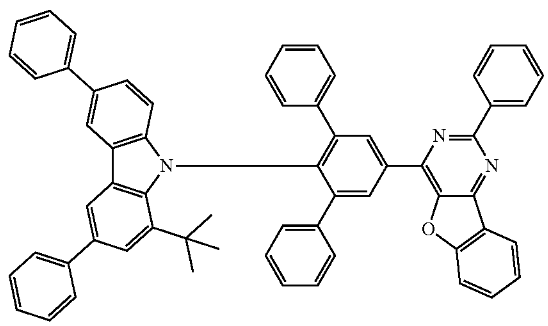
461
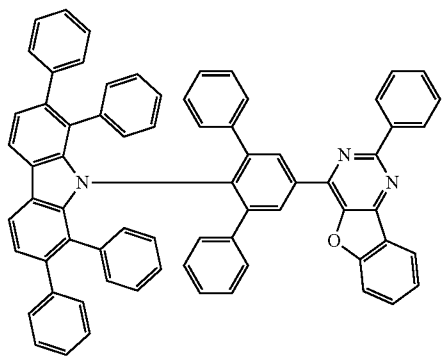
462
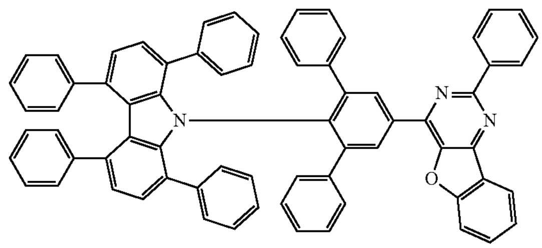

-continued
463
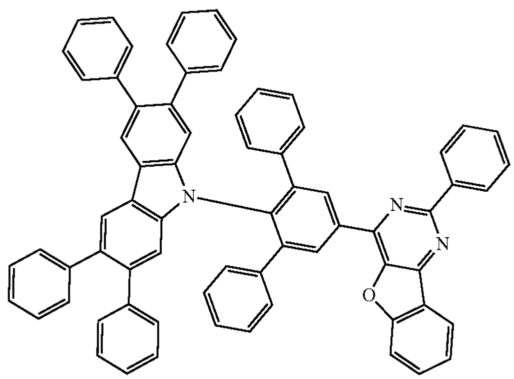
464
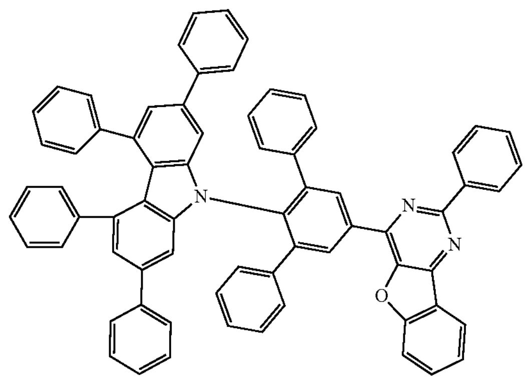
465
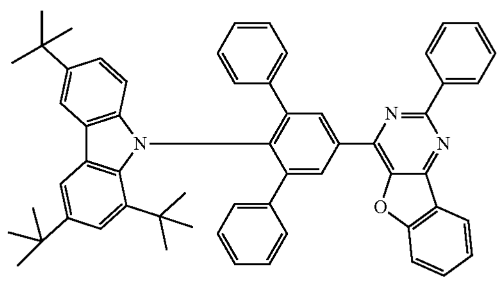
466
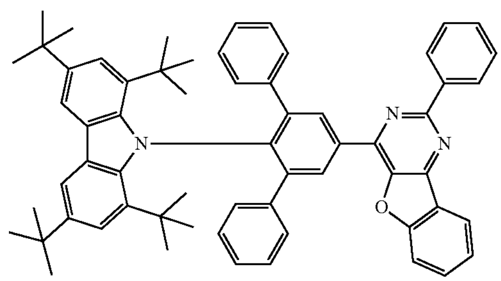
467
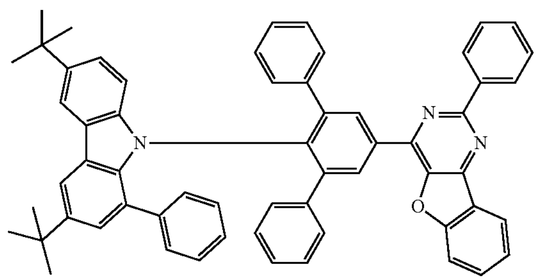
468
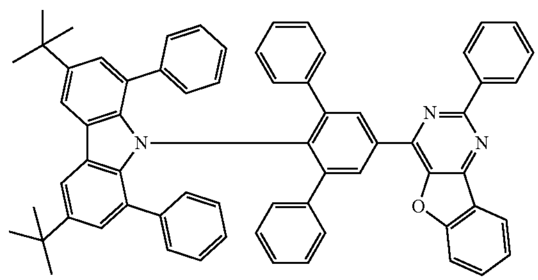
469
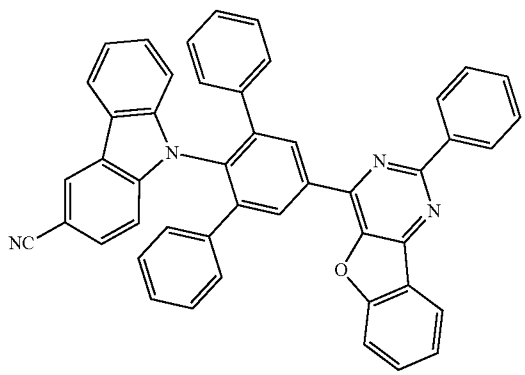
470
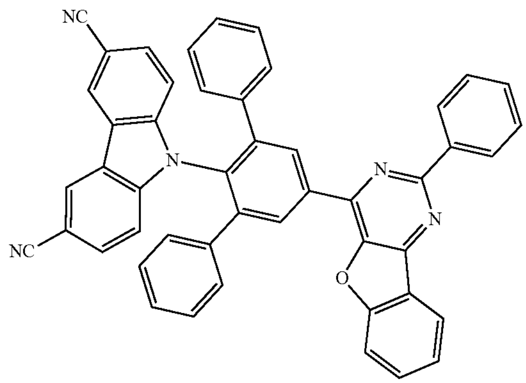

-continued
471
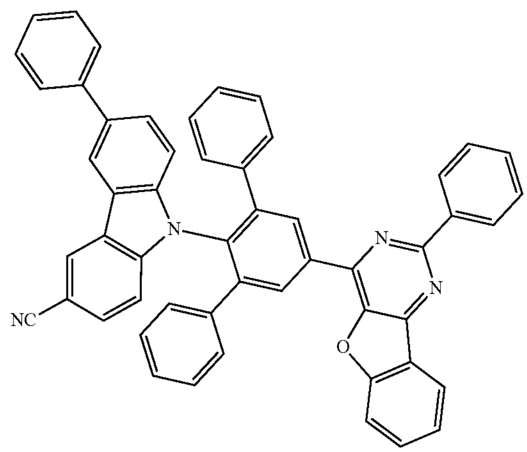
472
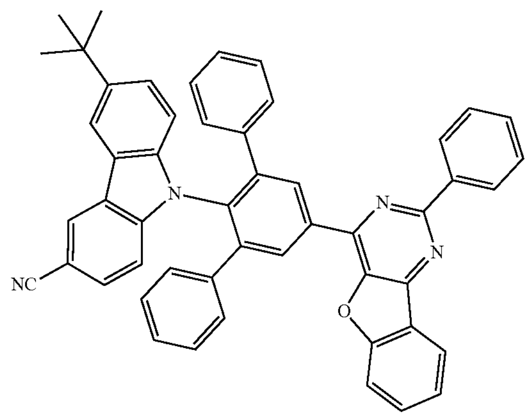
473
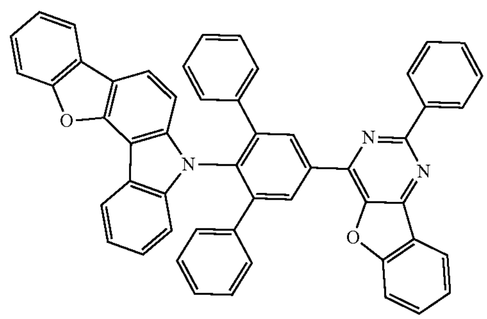
474
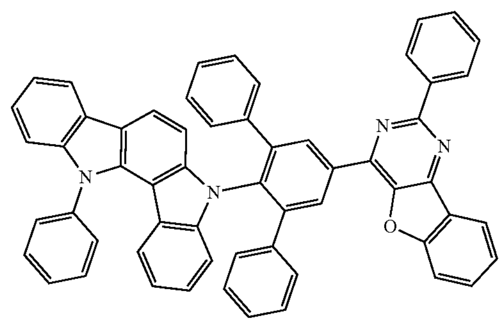
475
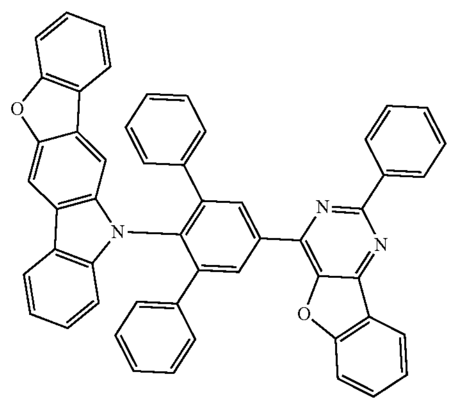
476
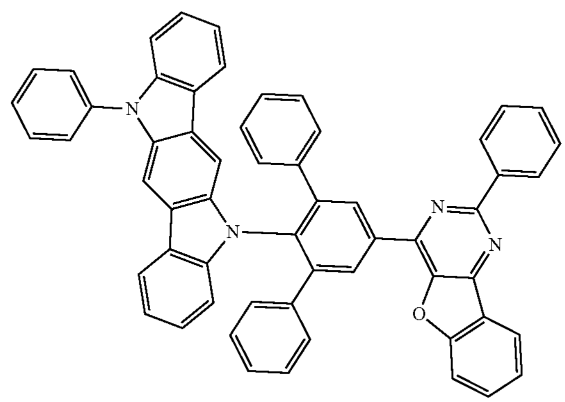
477
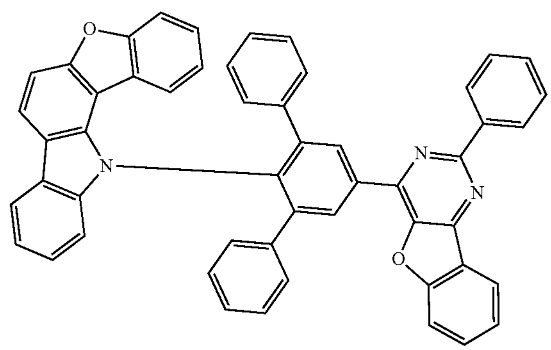
478
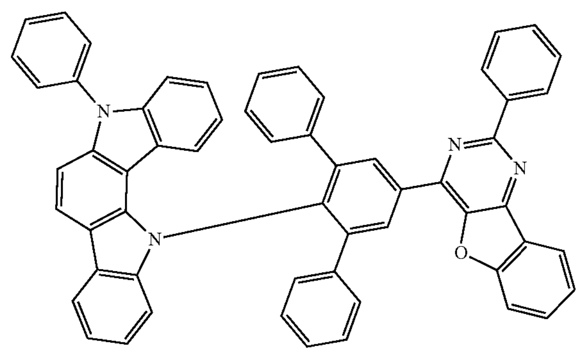

-continued
479
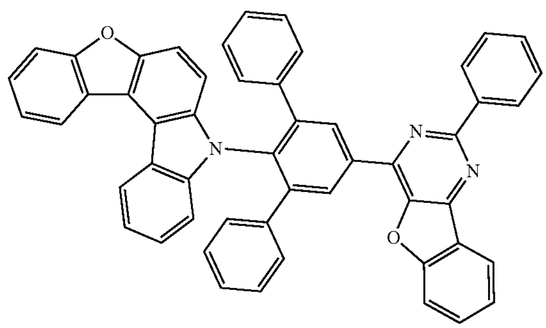
480
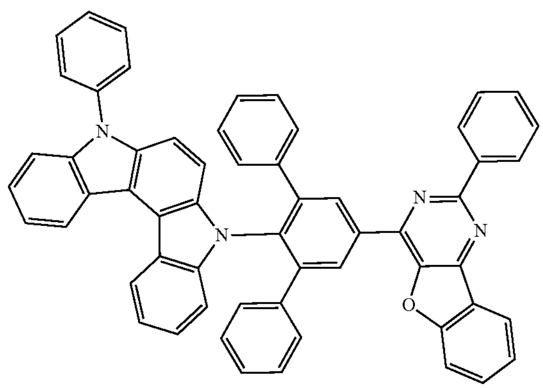
481
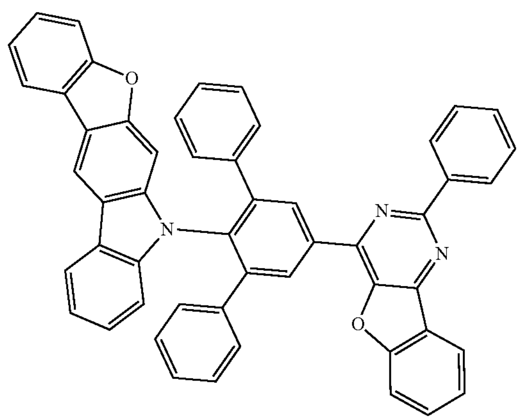
482
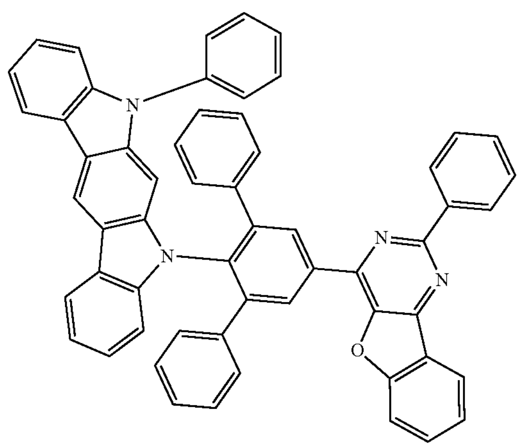
483
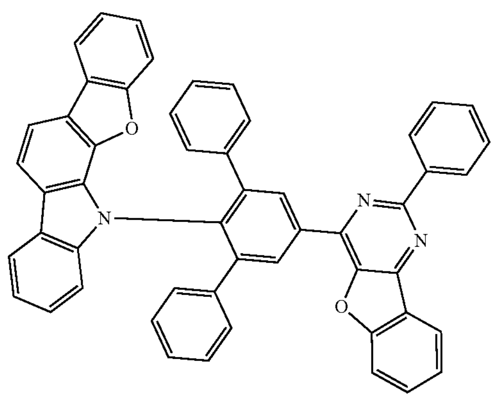
484
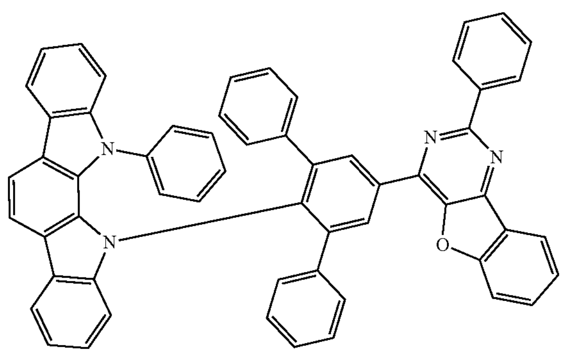

-continued
485
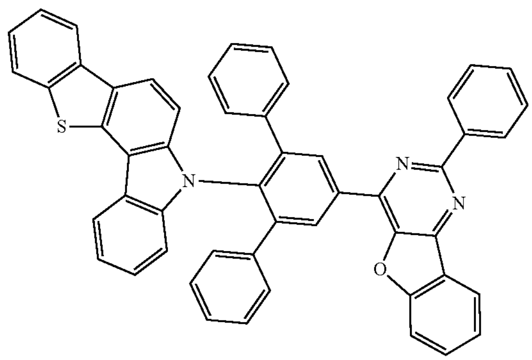
486
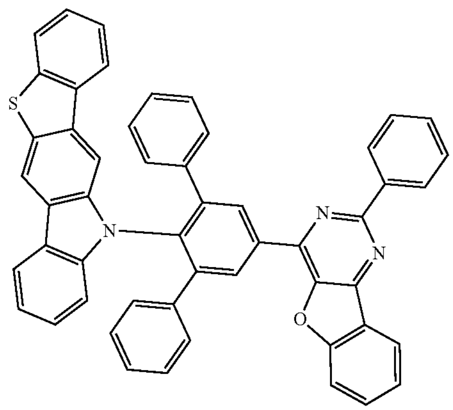
487
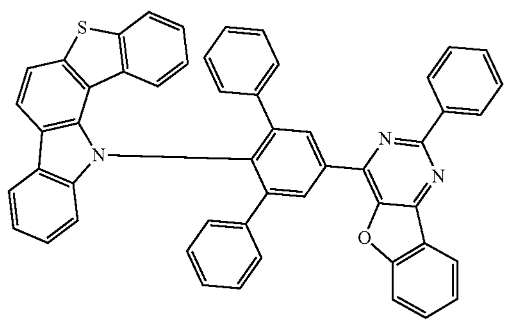
488
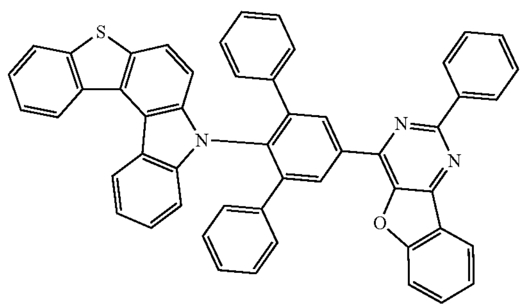
489
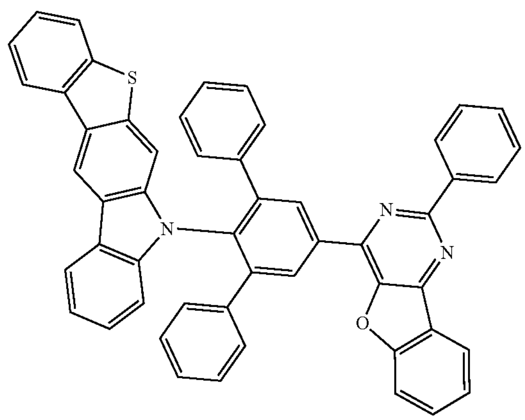
490
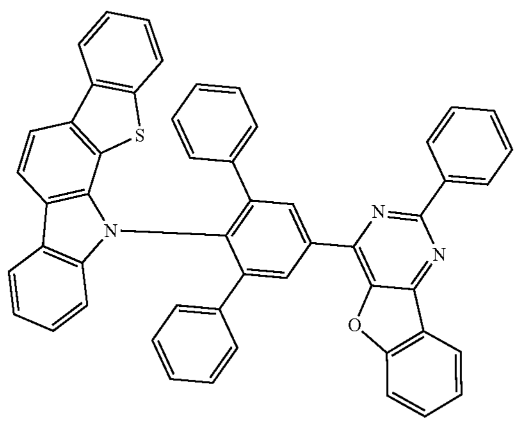
491
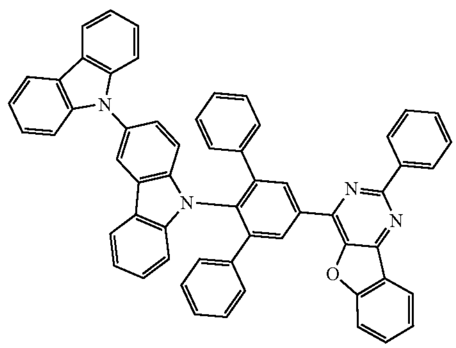
492
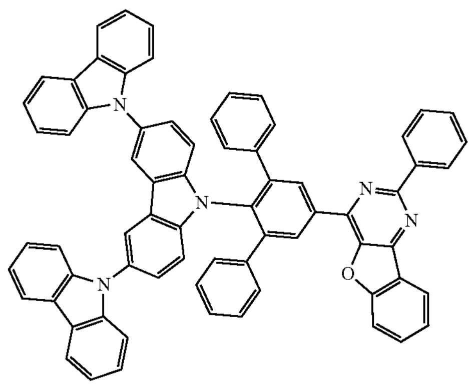

-continued
493
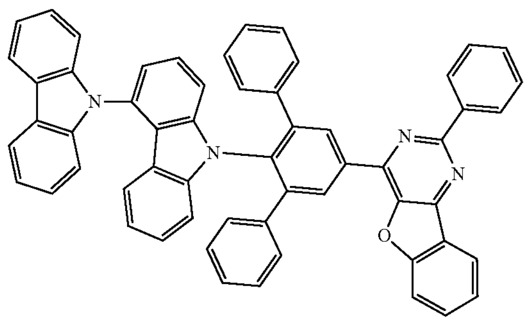
494
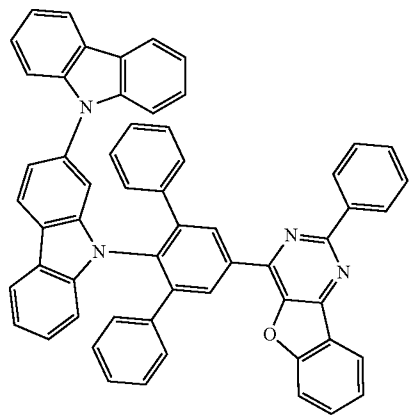
495
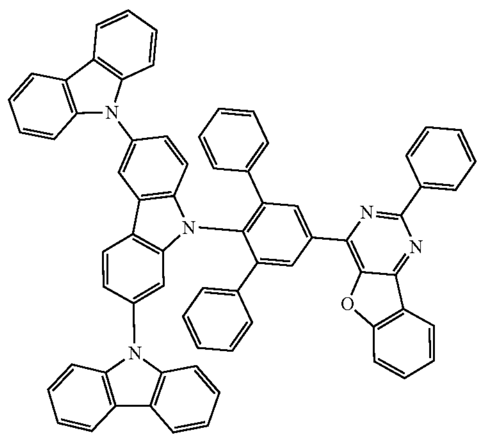
496
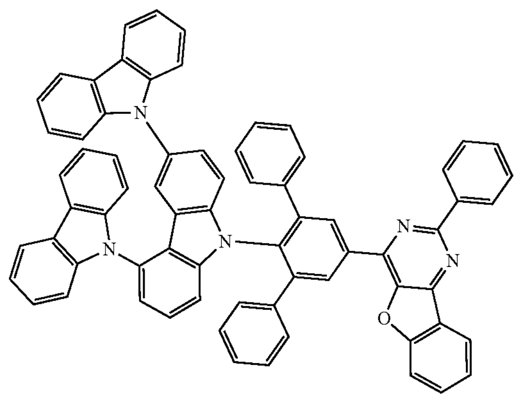
497
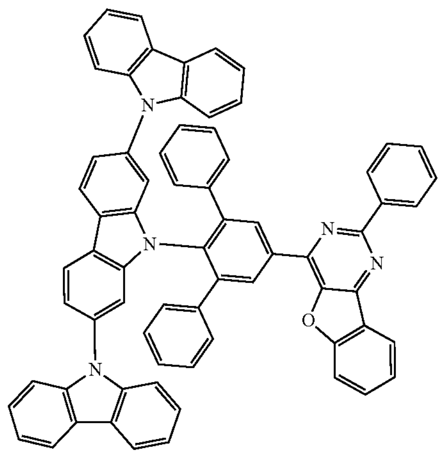
498
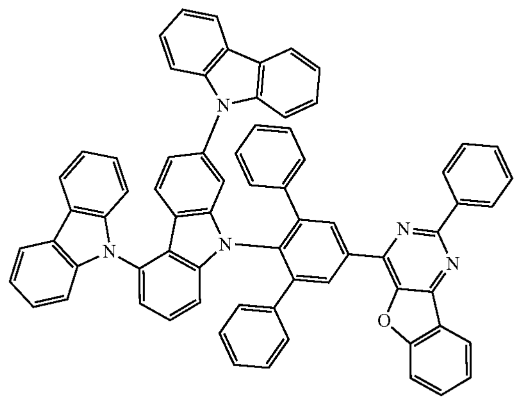

-continued
499
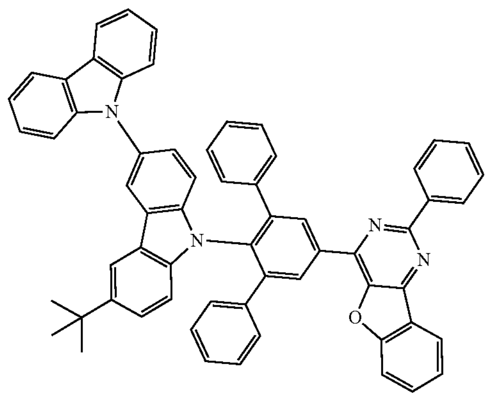
500
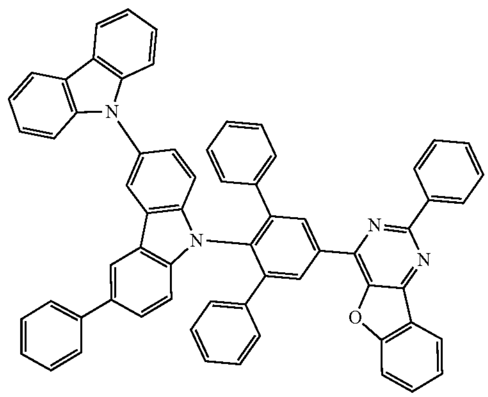
501
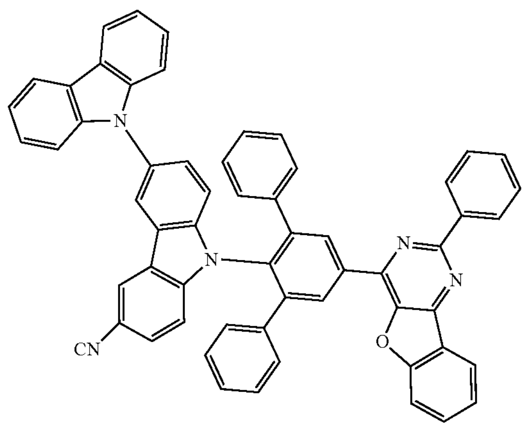
502
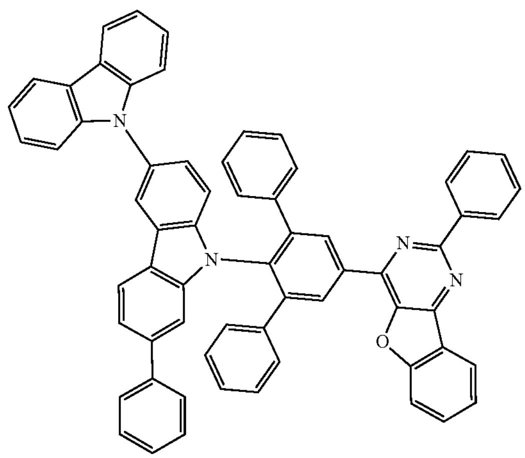
503
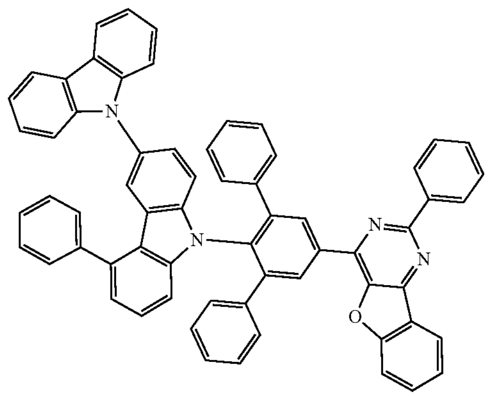
504
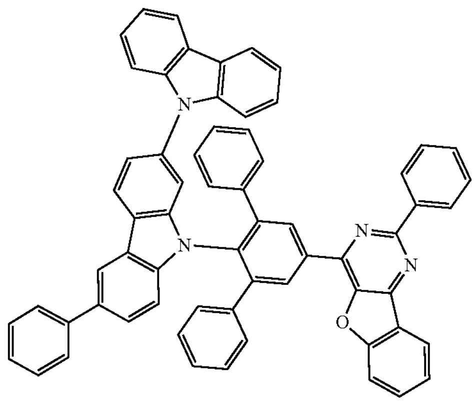

-continued
505
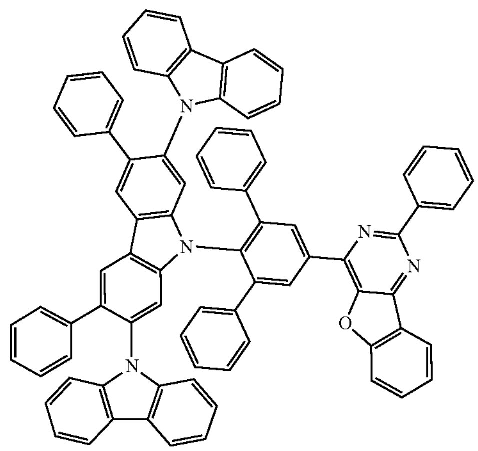
506
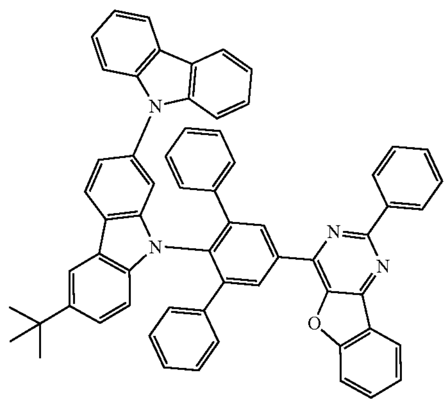
507
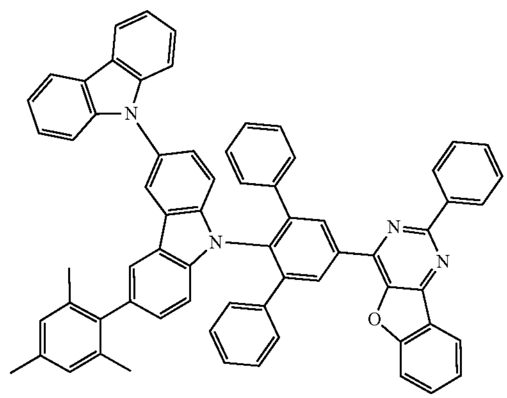
508
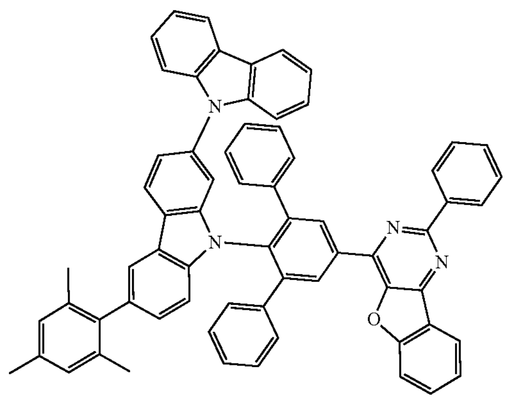
509
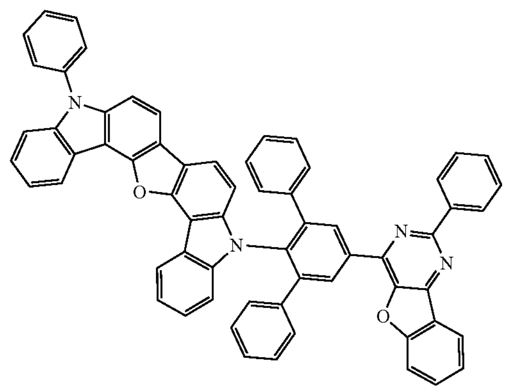
510
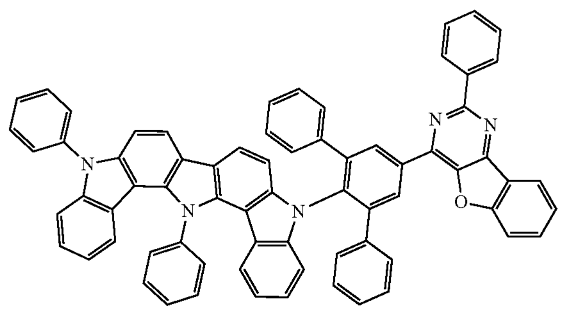
511
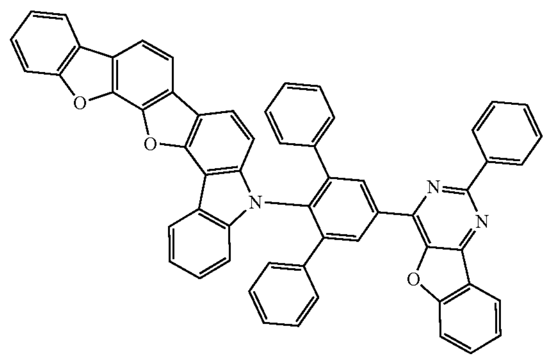
512
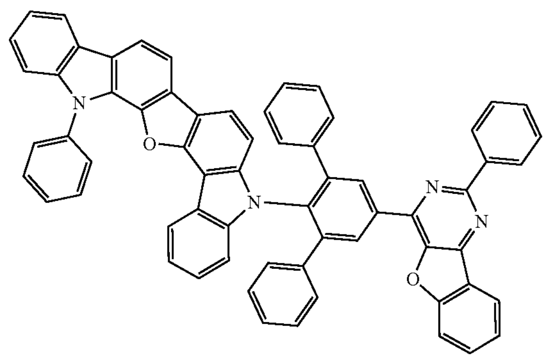

-continued
513
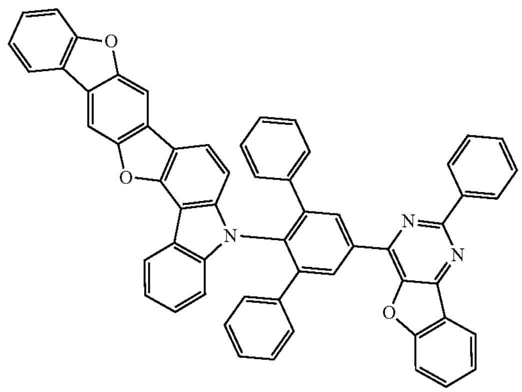
514
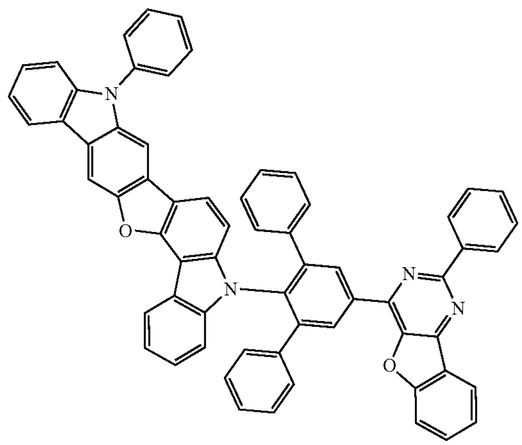
515
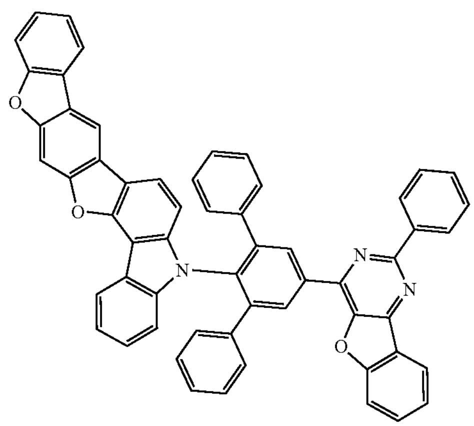
516
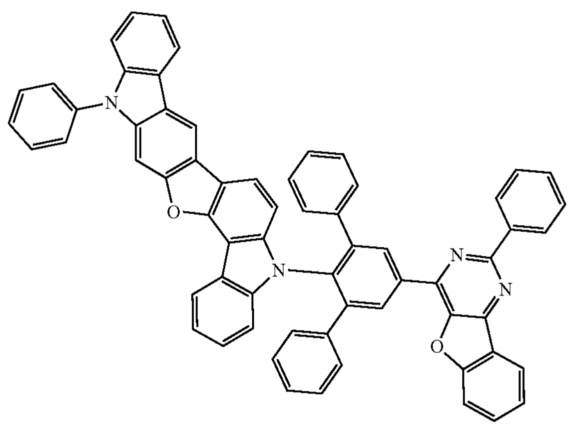
517
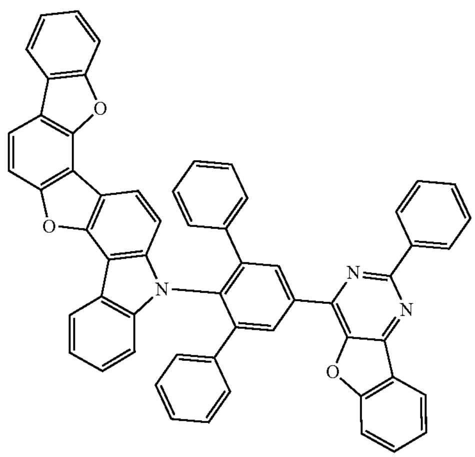
518
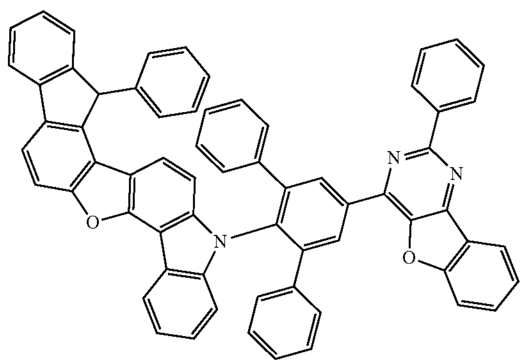

-continued
519
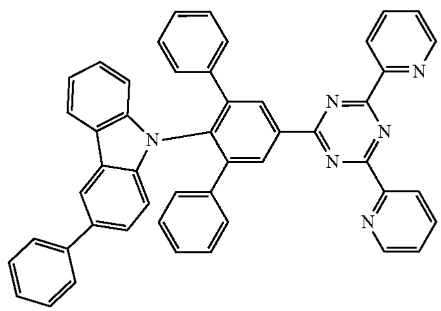
520
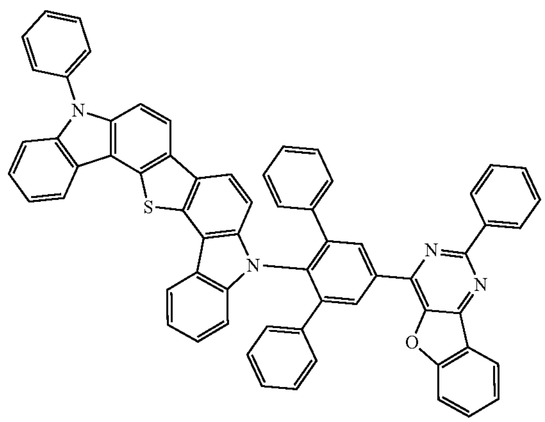
521
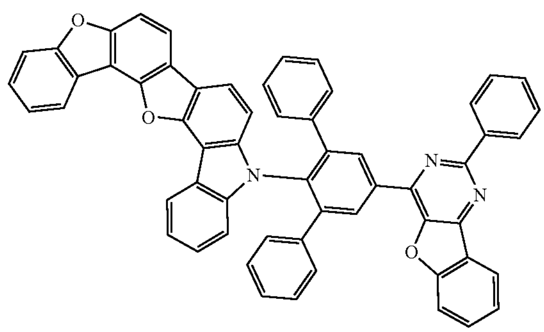
522
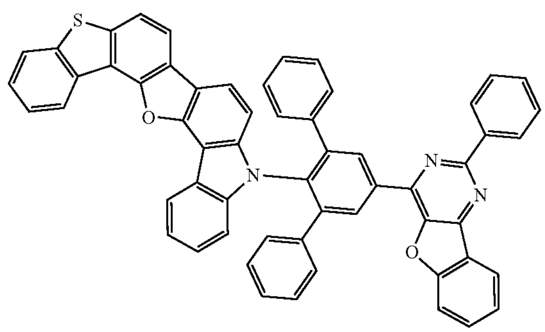
523
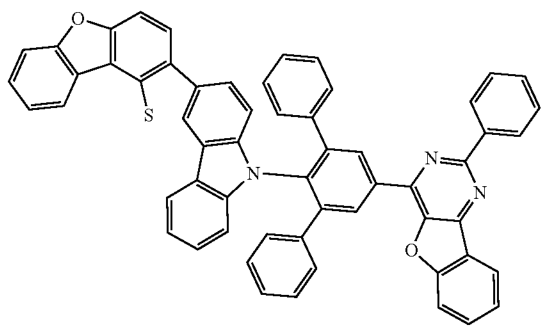
524
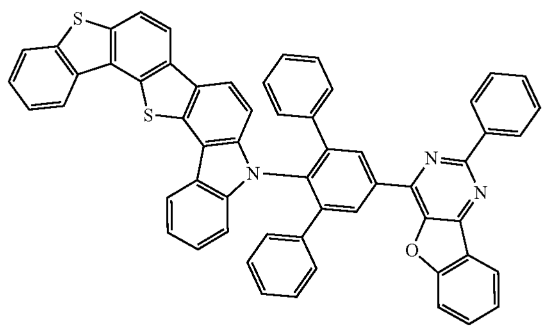
525
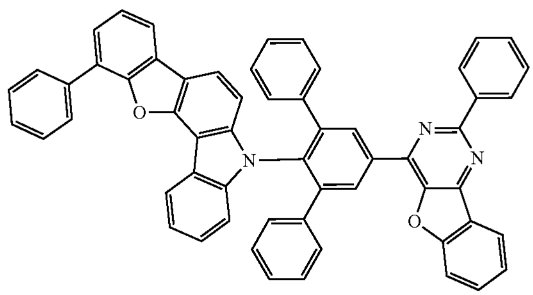
526
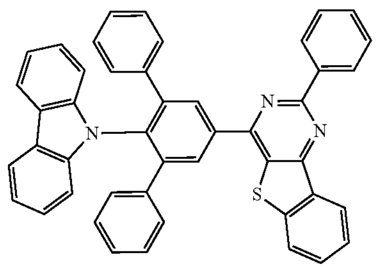

-continued
527
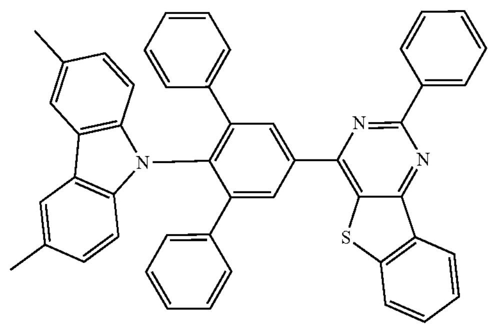
528
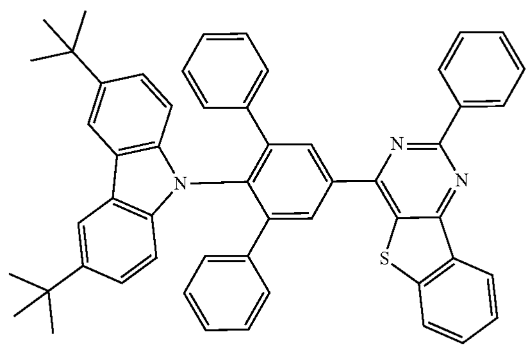
529
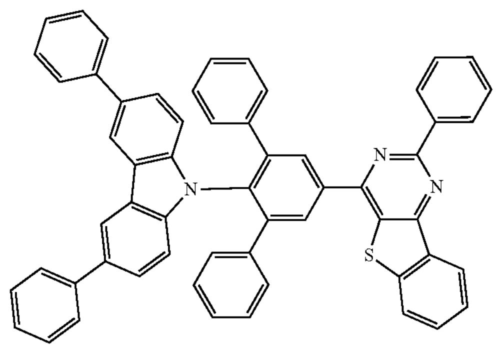
530
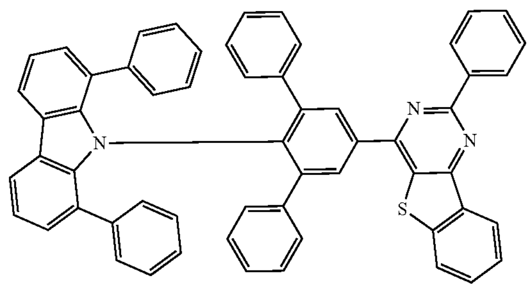
531
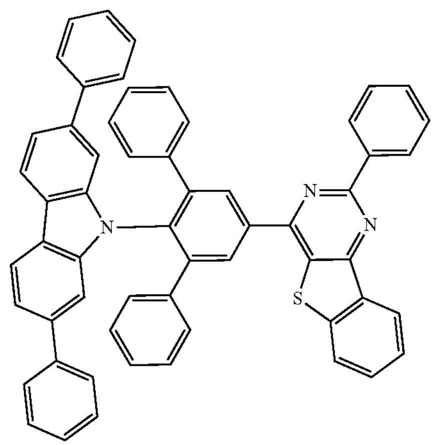
532
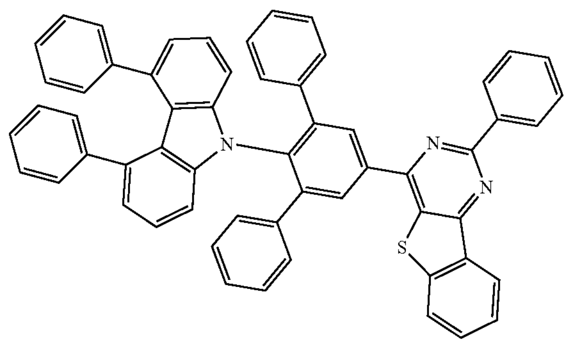
533
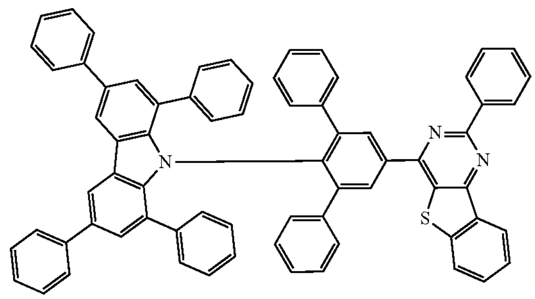
534
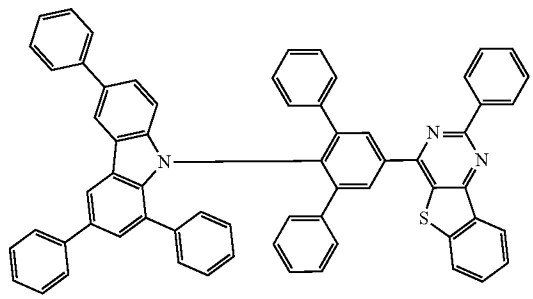

-continued
535
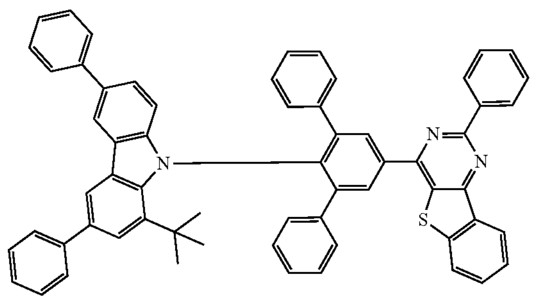
536
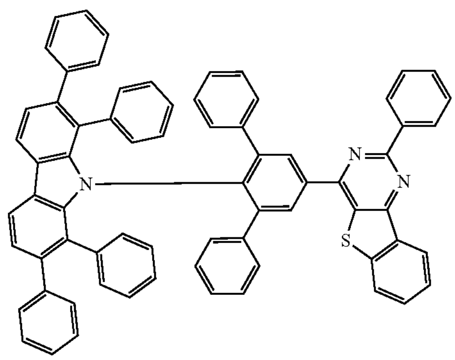
537
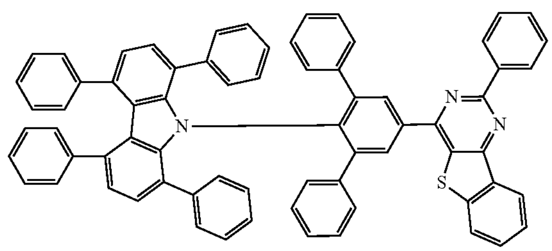
538
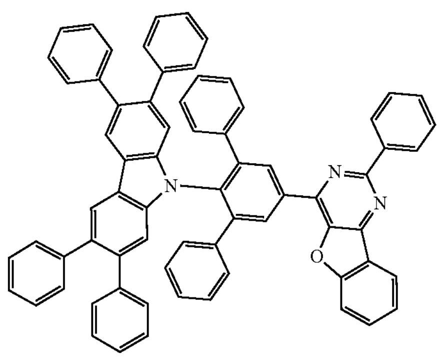
539
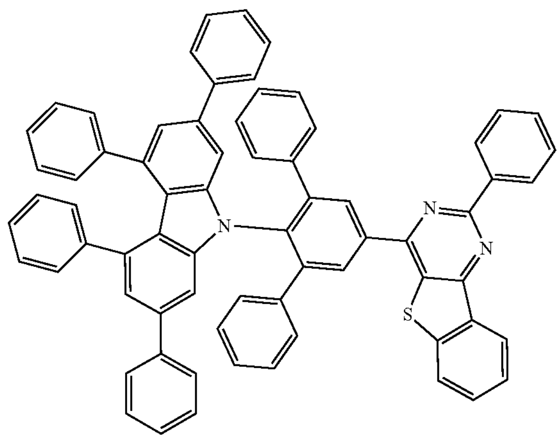
540
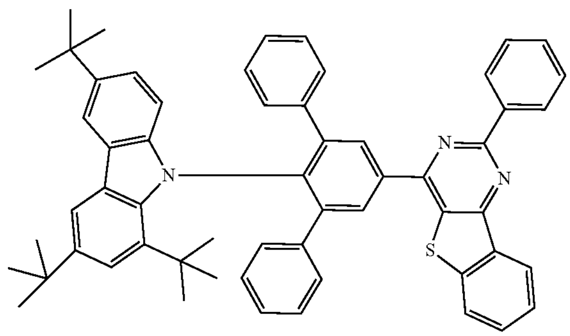
541
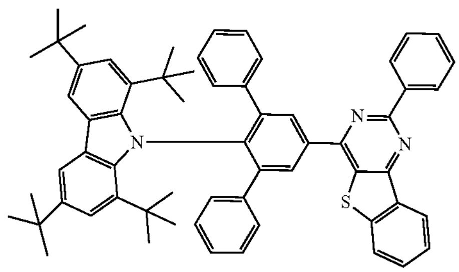
542
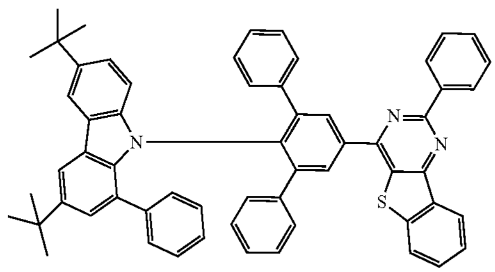

-continued
543
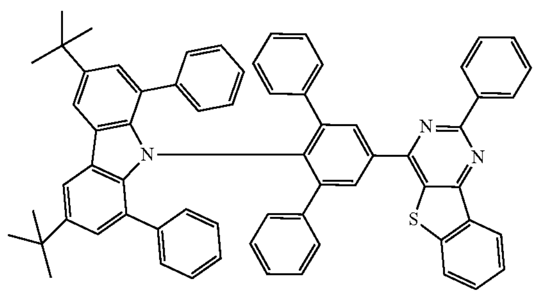
544
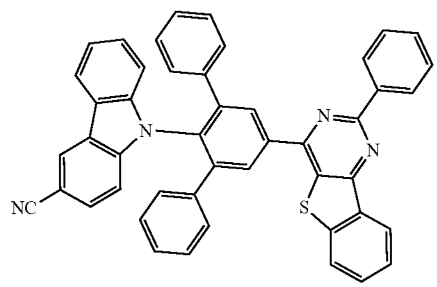
545
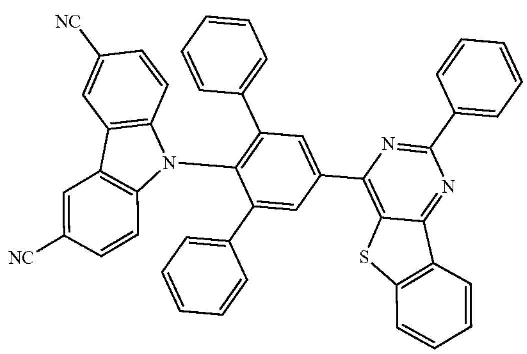
546
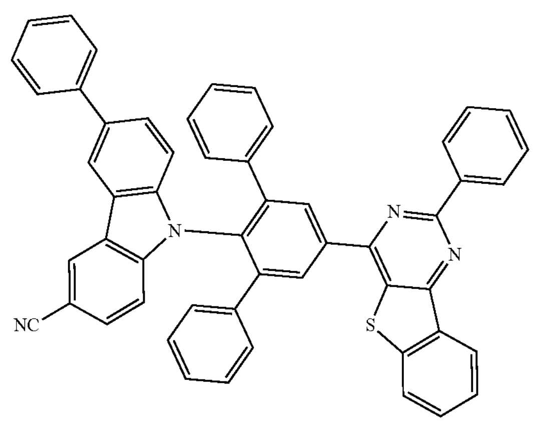
547
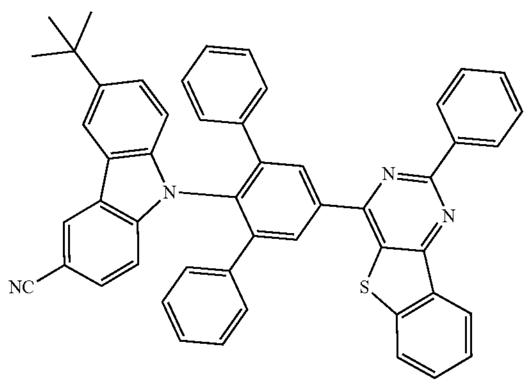
548
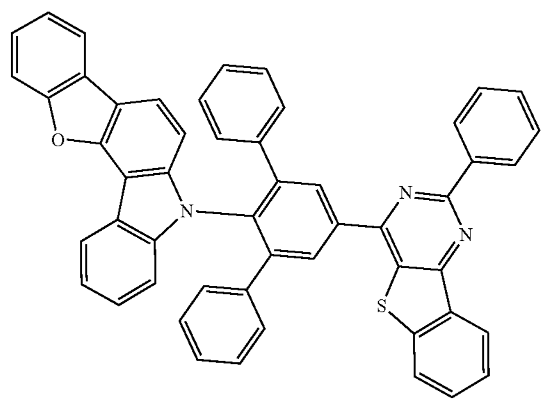
549
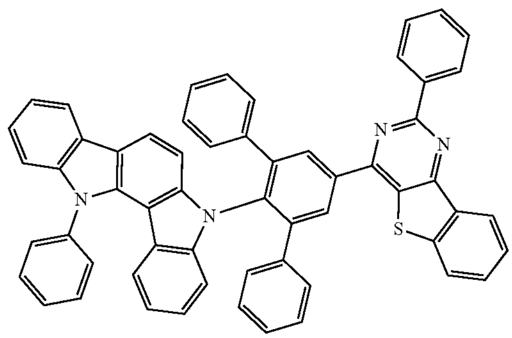
550
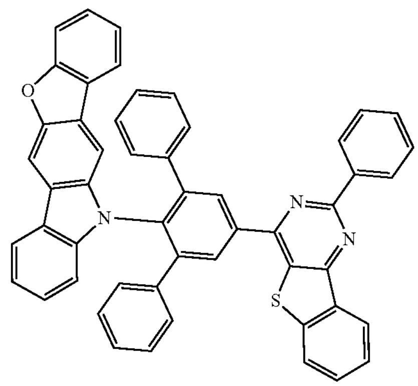

-continued
551
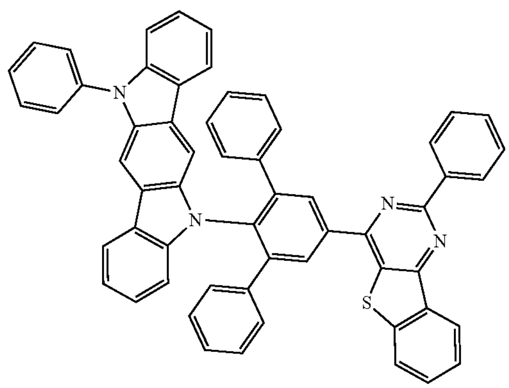
552
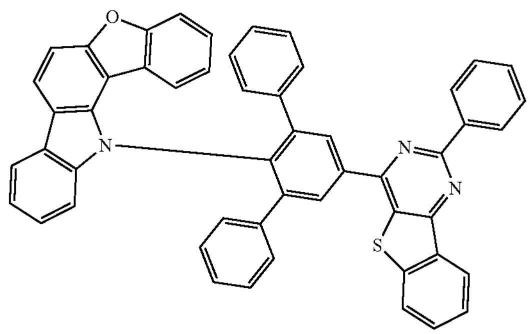
553
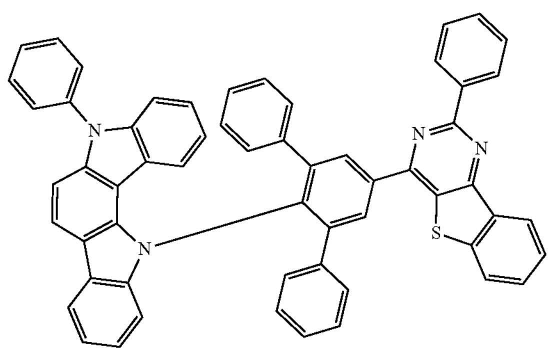
554
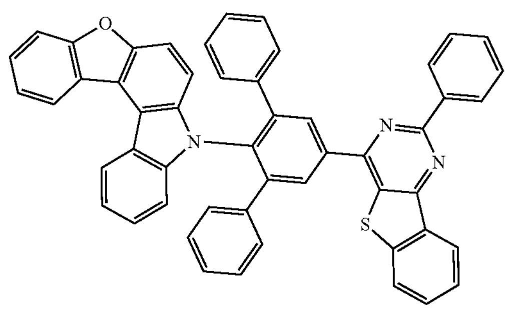
555
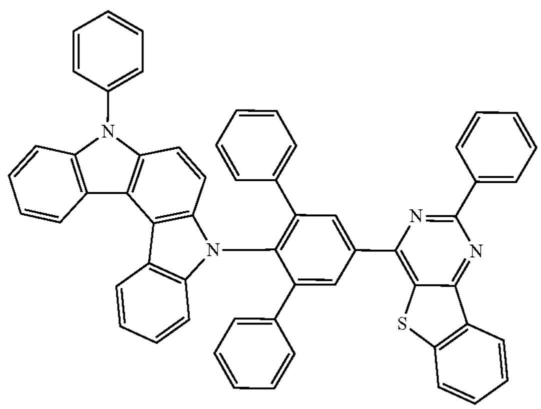
556
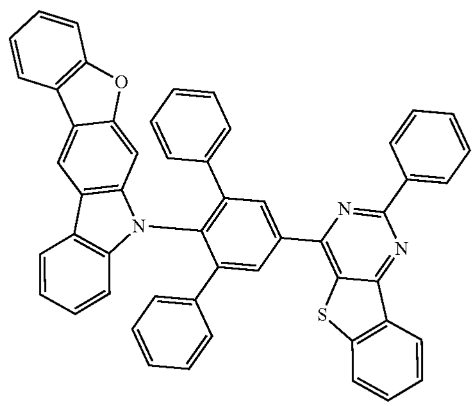
557
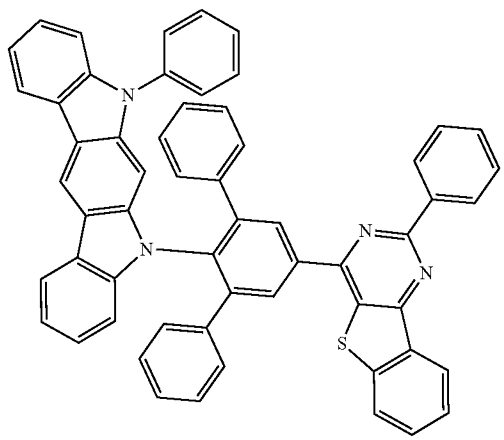
558
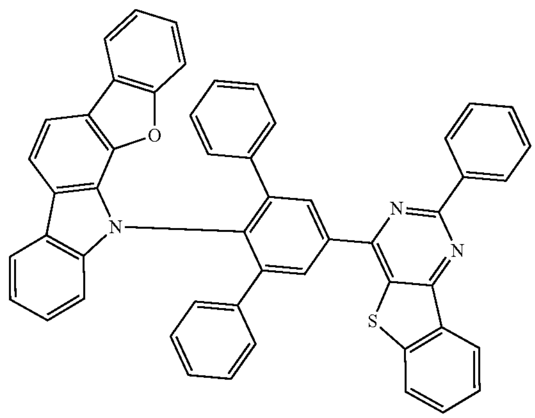

-continued
559
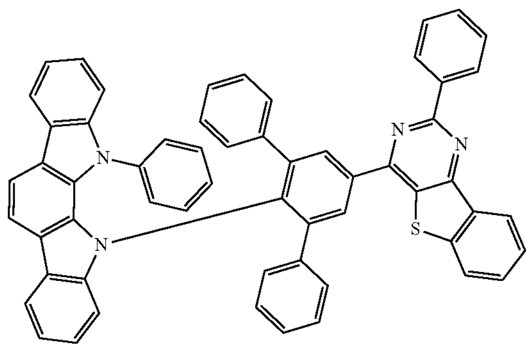
560
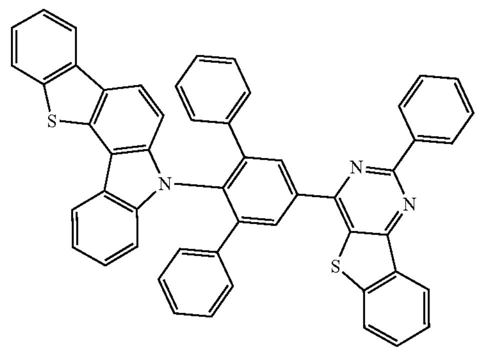
561
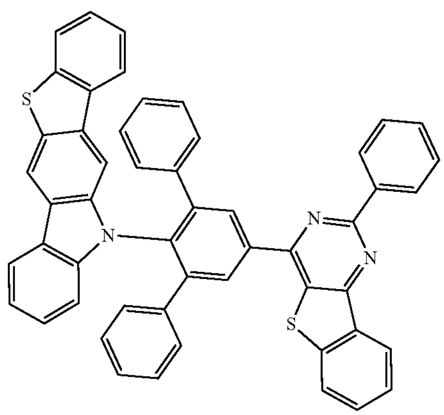
562
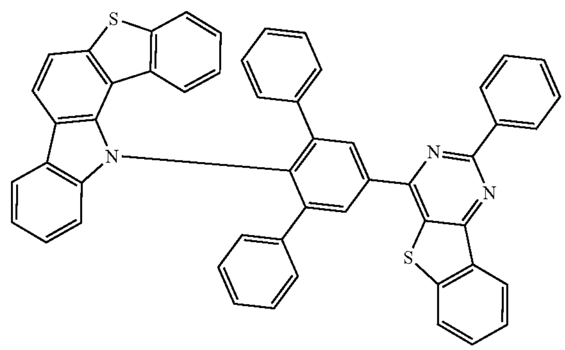
563
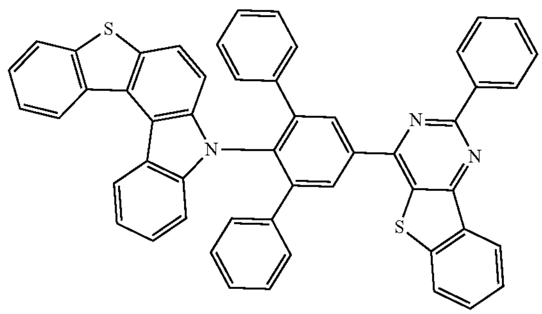
564
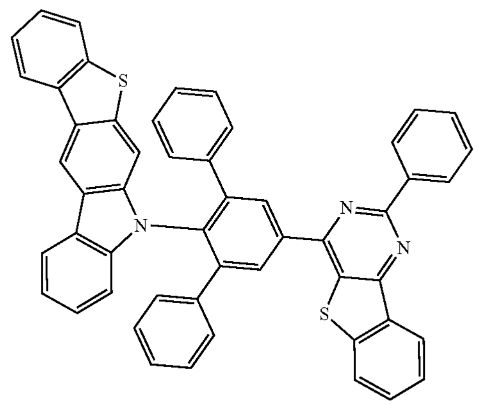

-continued
565
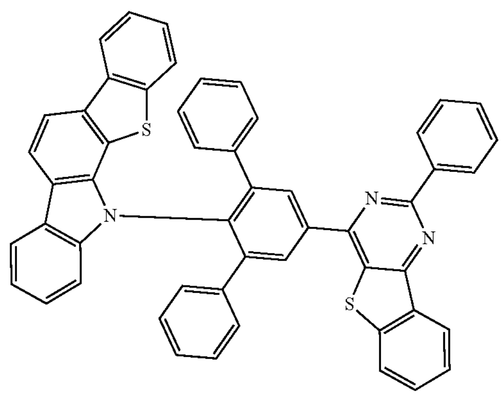
566
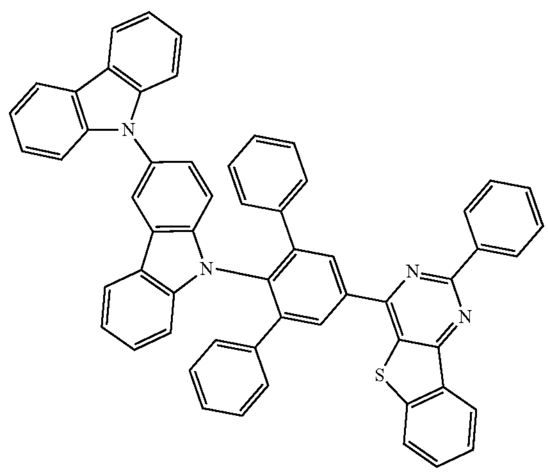
567
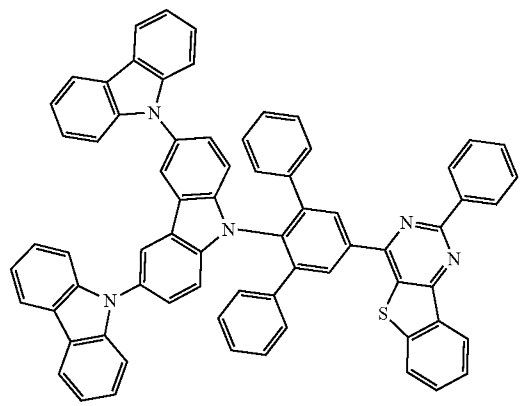
568
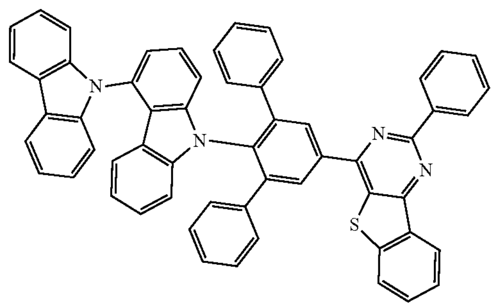
569
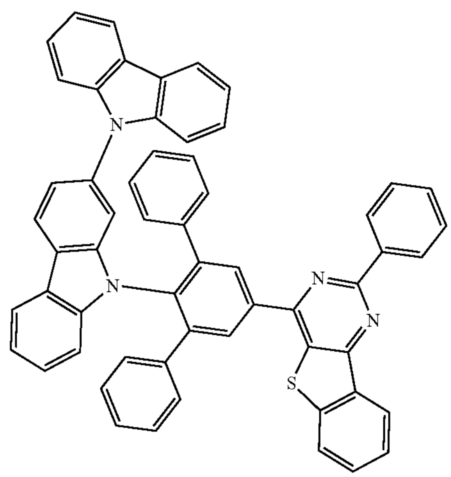
570
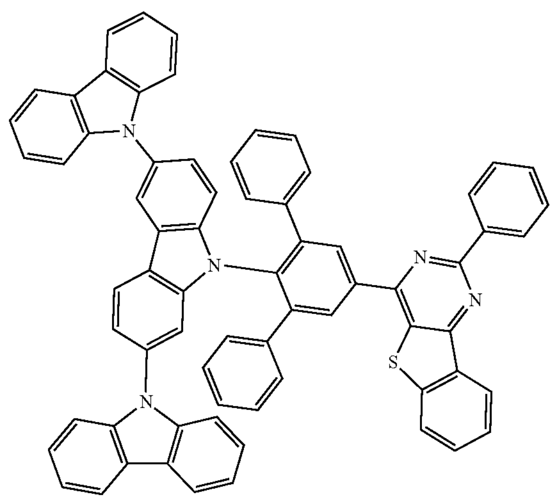

-continued
571
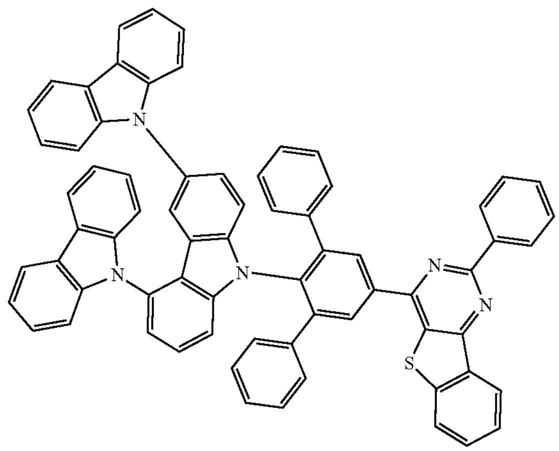
572
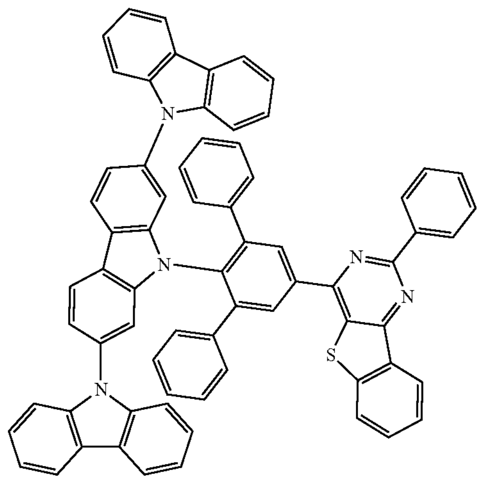
573
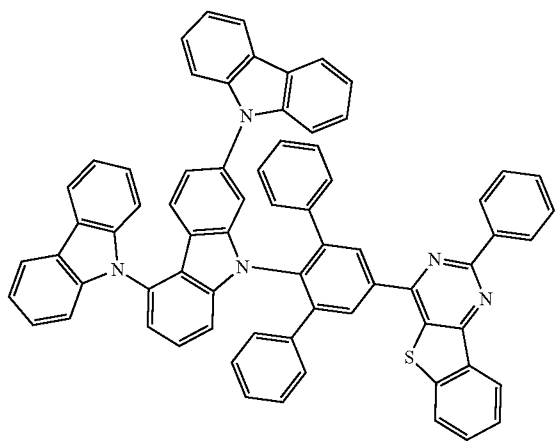
574
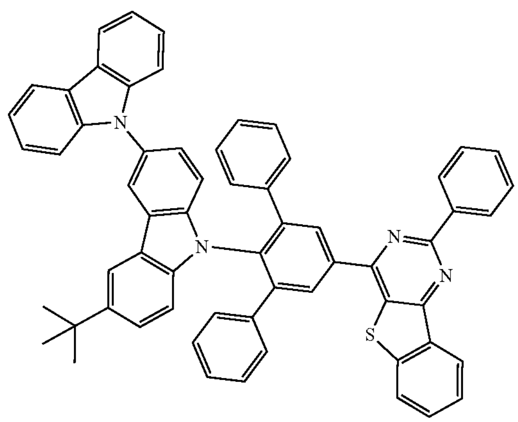
575
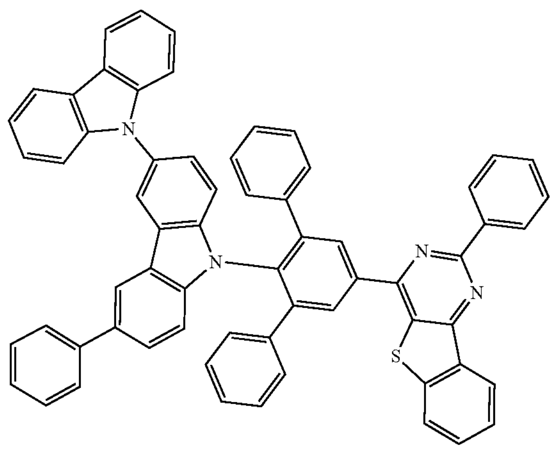
576
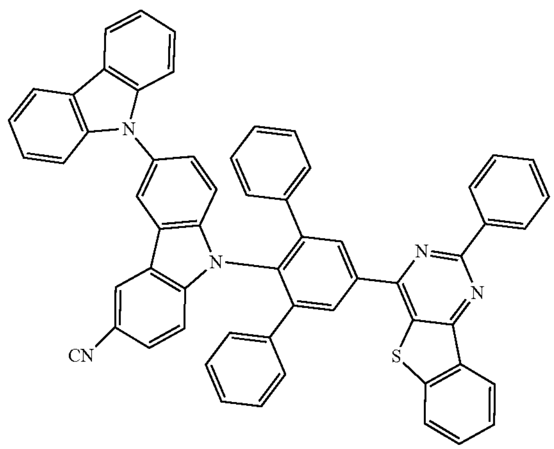

-continued
577
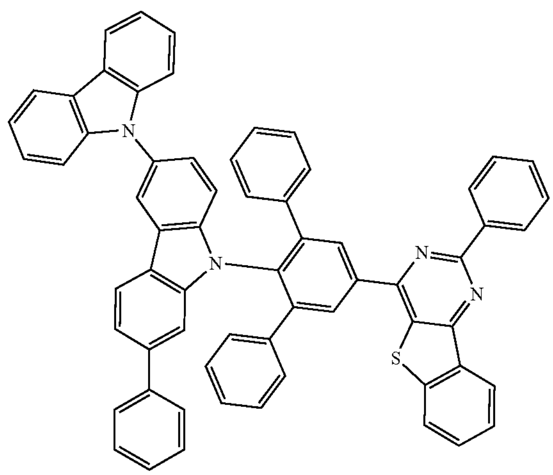
578
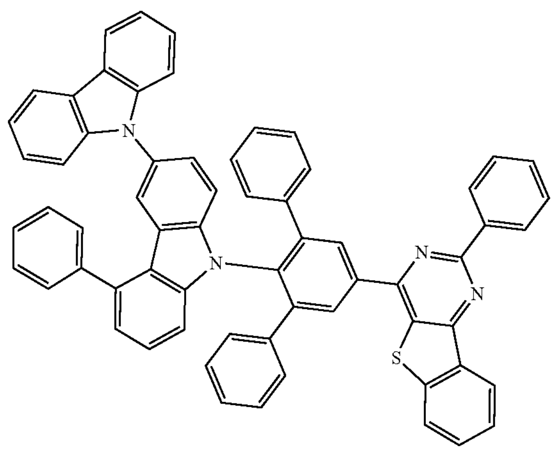
579
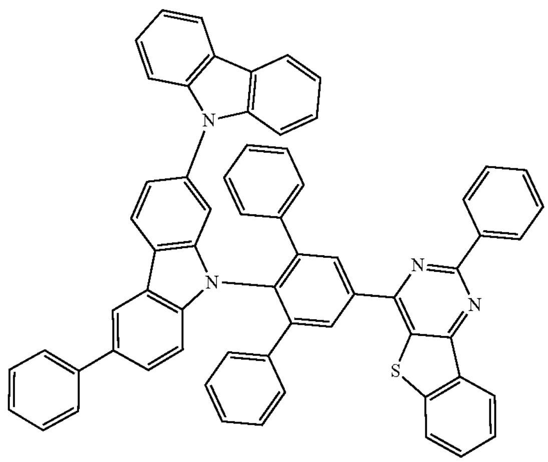
580
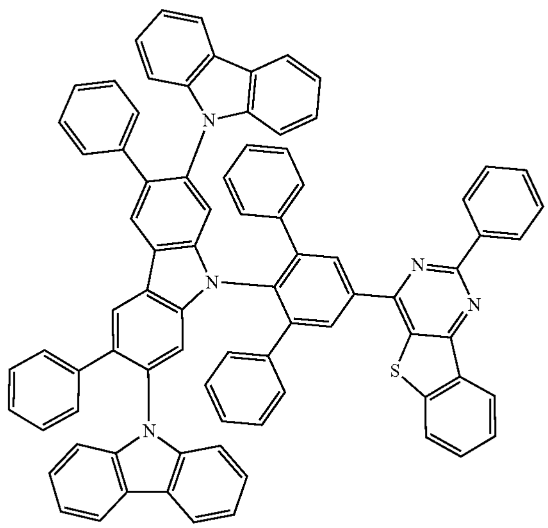
581
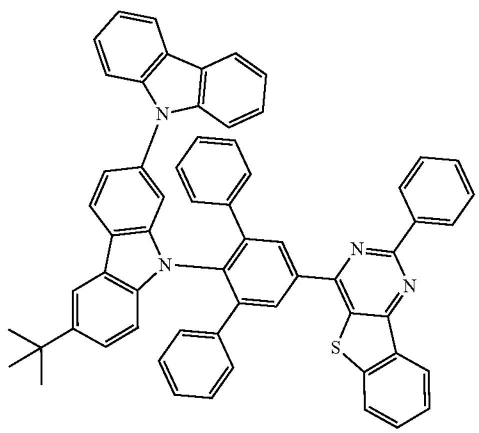
582
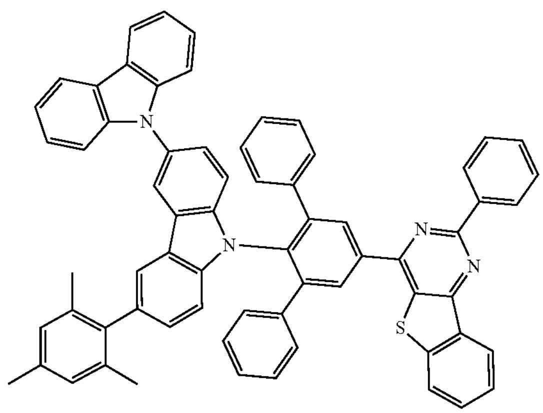

-continued
583
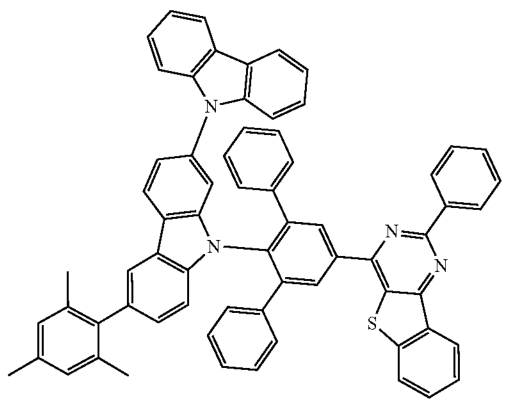
584
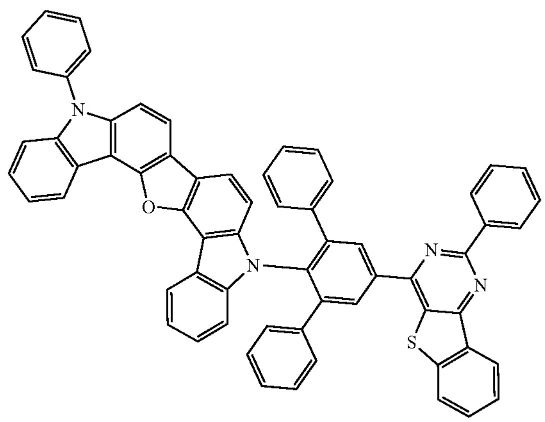
585
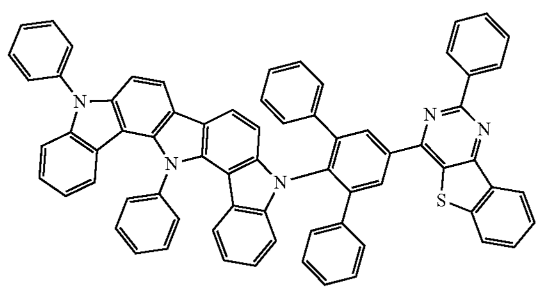
586
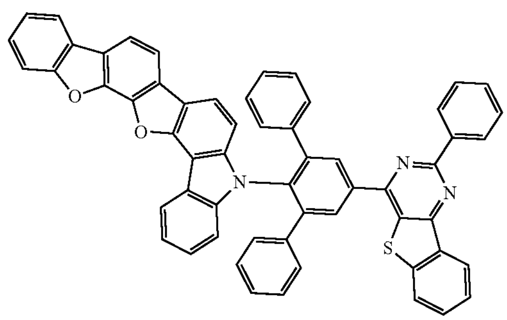
587
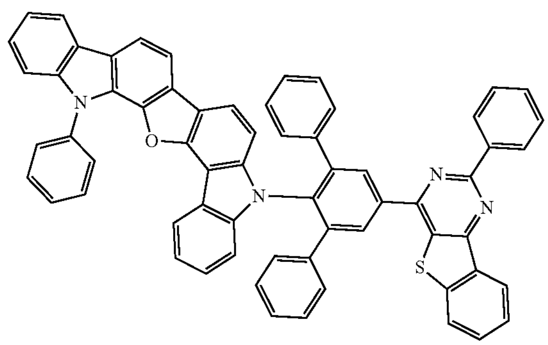
588
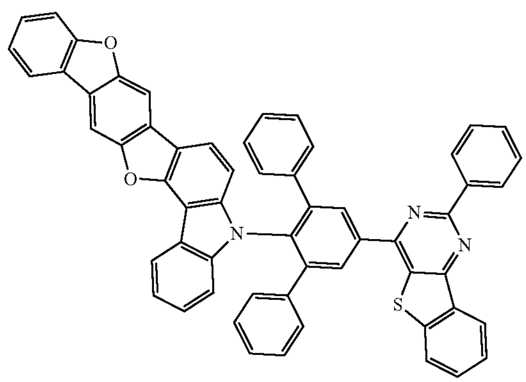
589
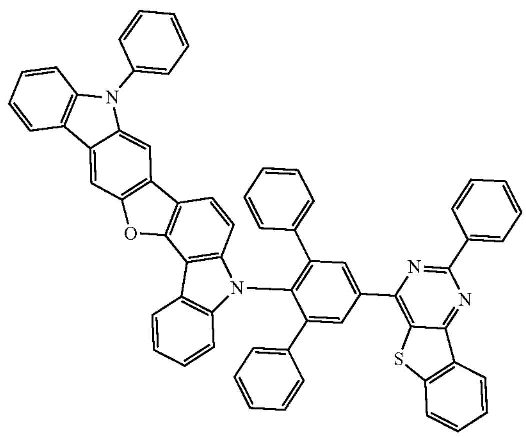
590
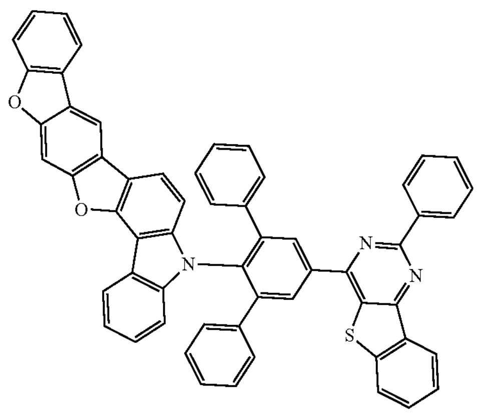

-continued
591
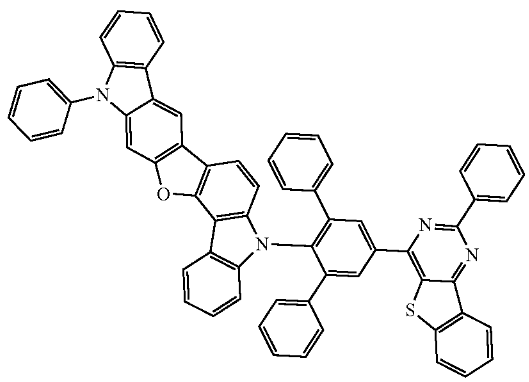
592
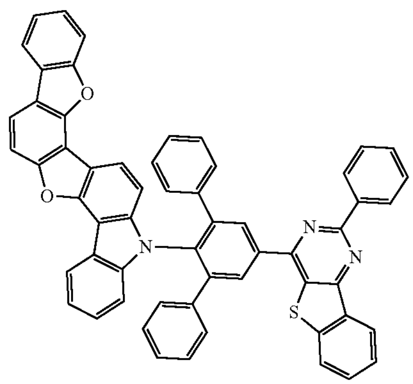
593
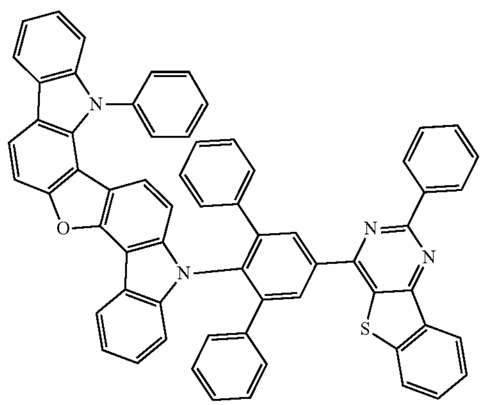
594
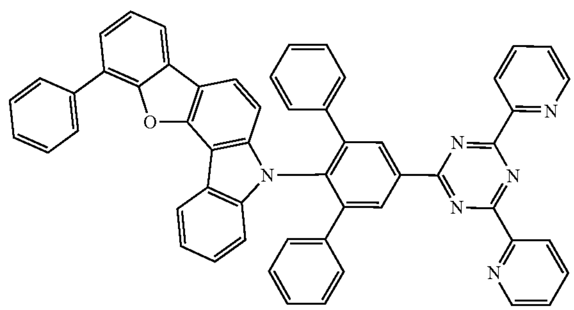
595
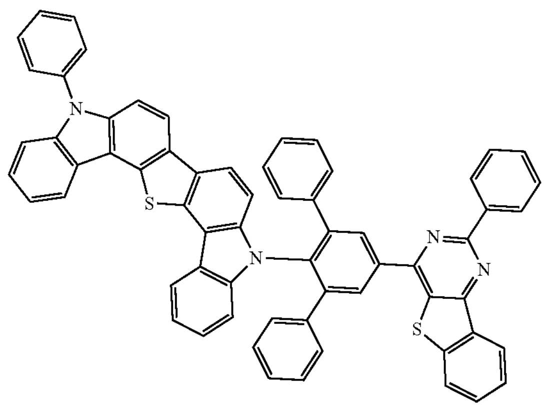
596
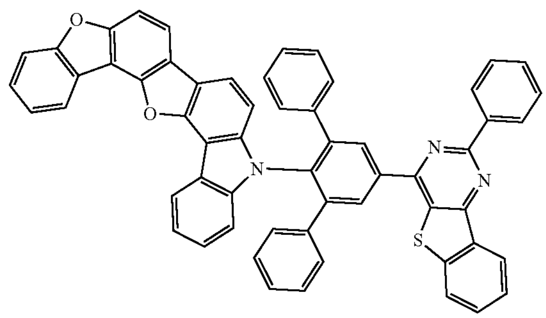
597
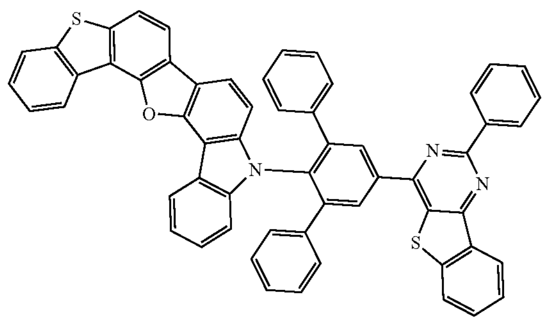
598
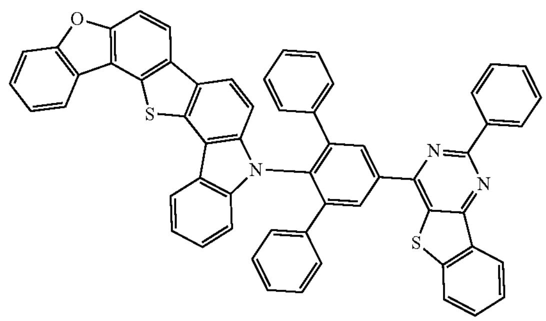

-continued
599
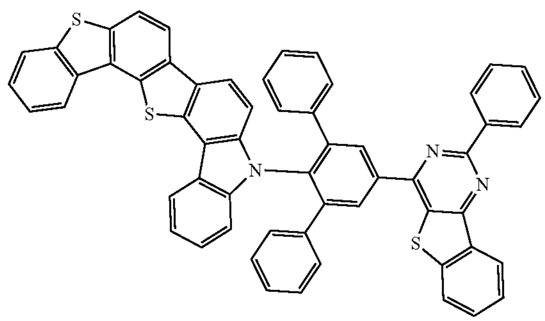
600
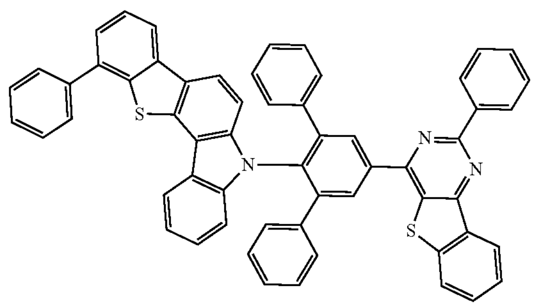
601
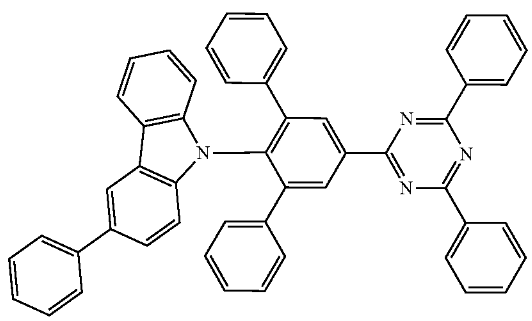
602
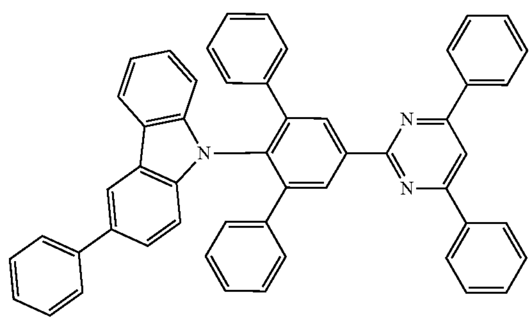
603
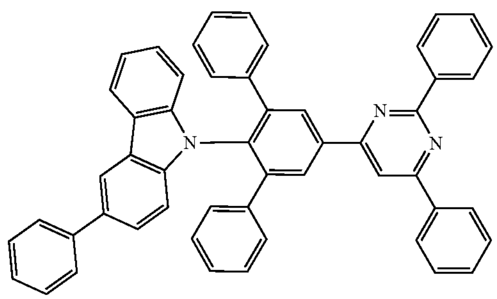
604
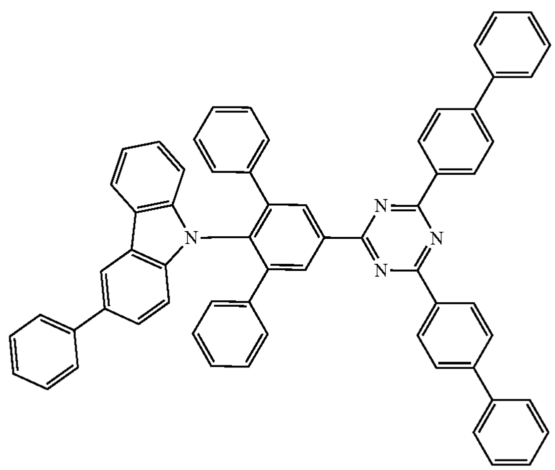
605
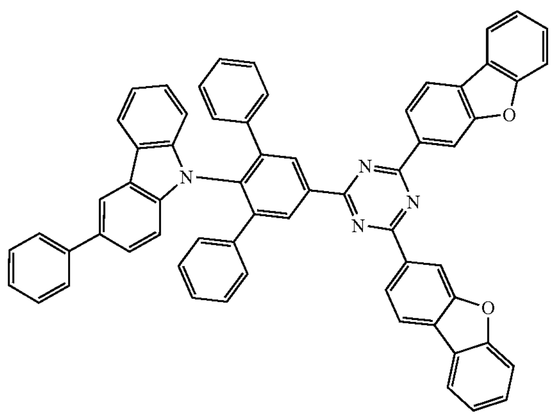
606
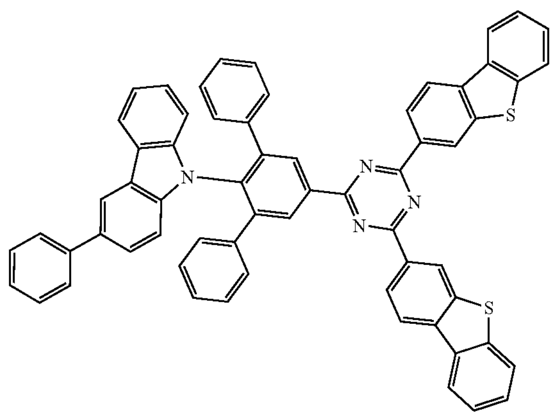

-continued
607
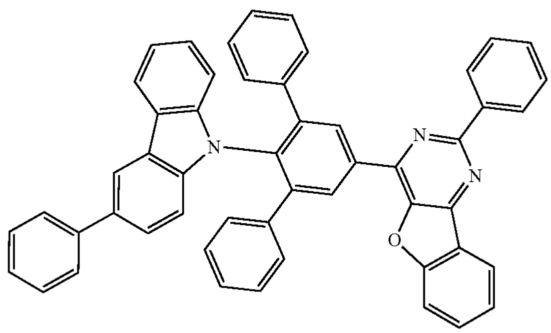
608
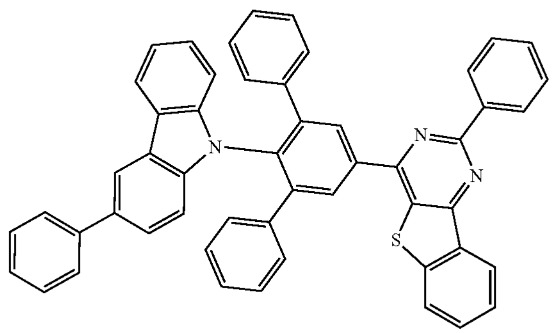
609
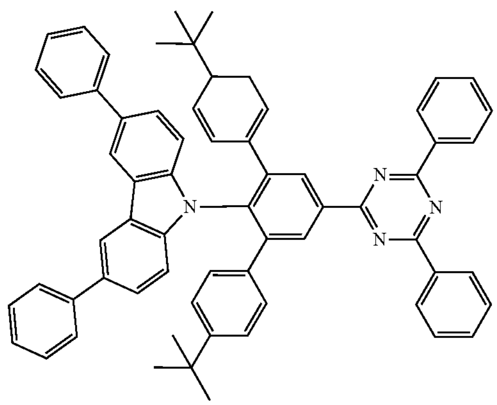
610
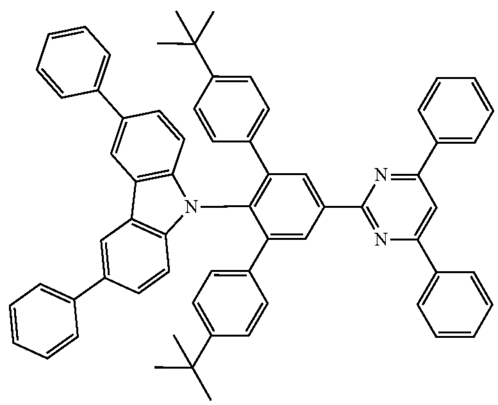
611
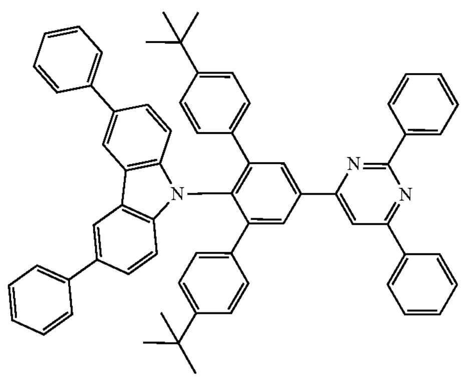
612
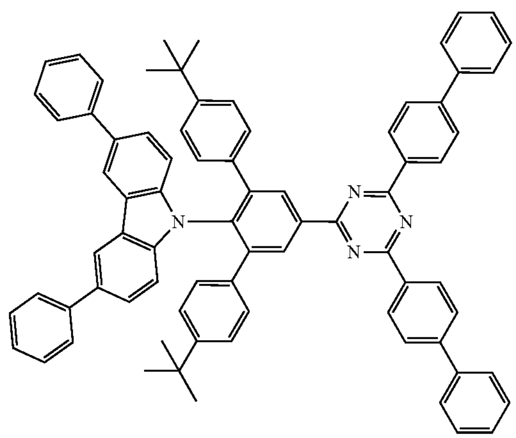
613
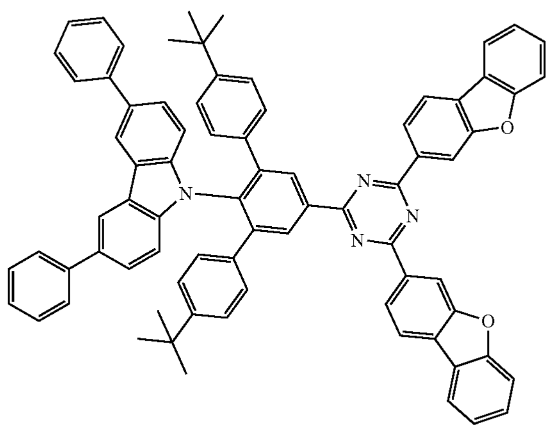
614
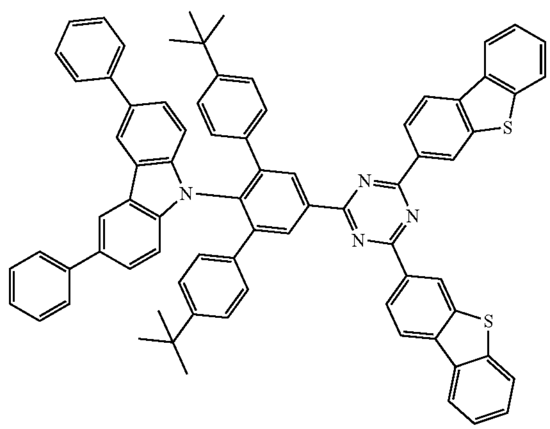

-continued
615
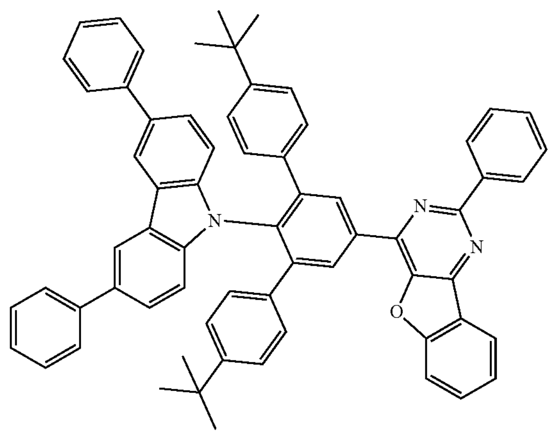
616
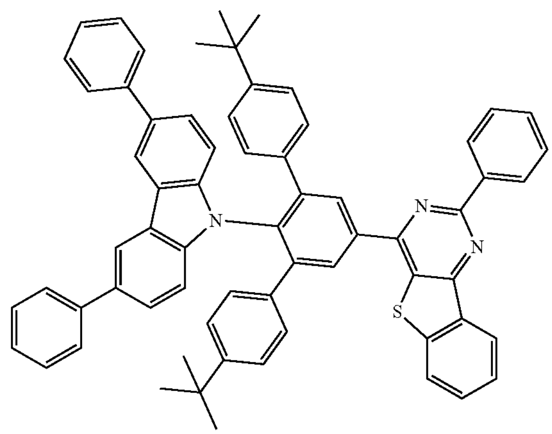
617
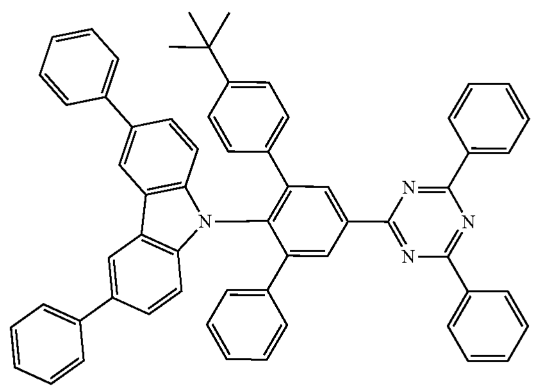
618
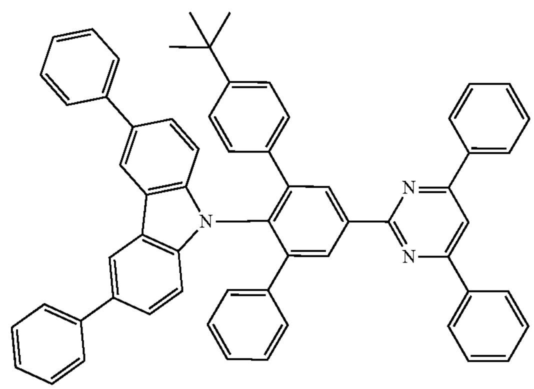
619
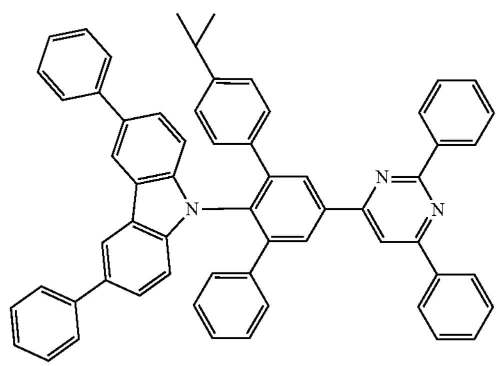
620
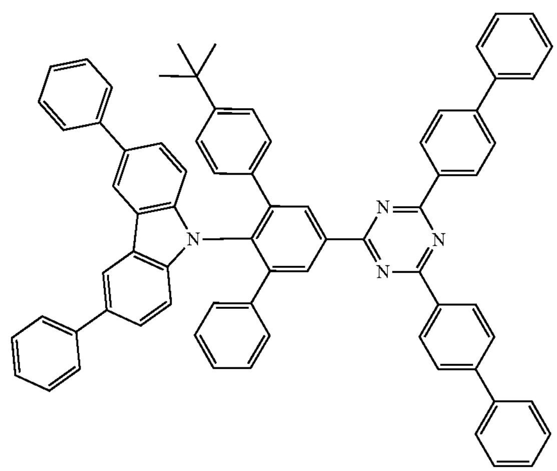

-continued
621
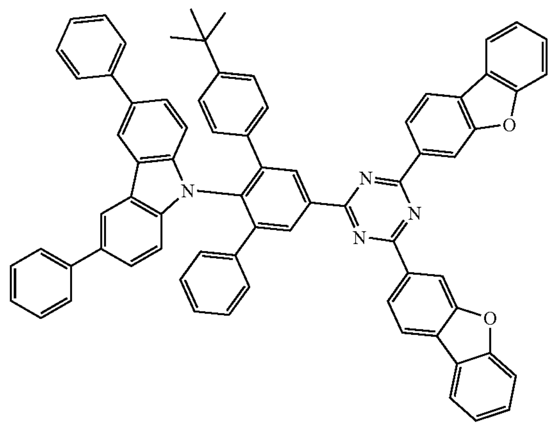
622
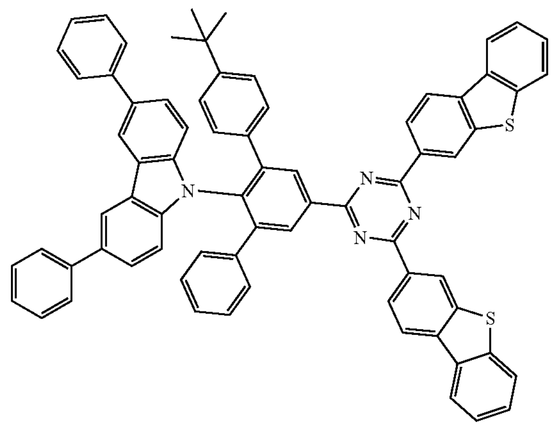
623
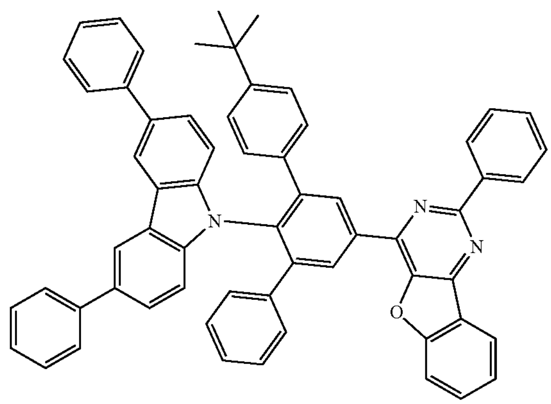
624
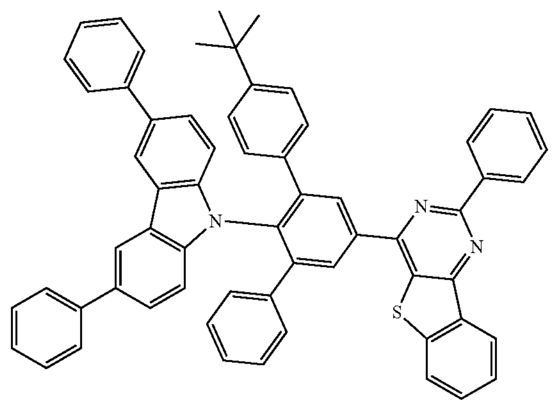
625
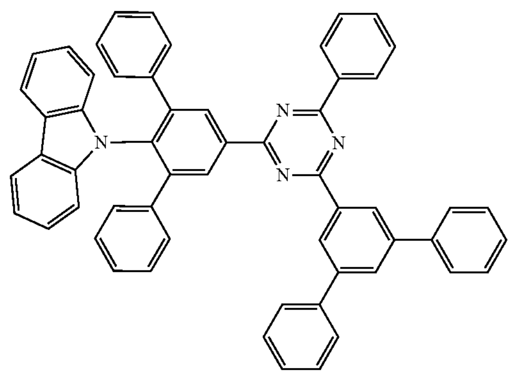
626
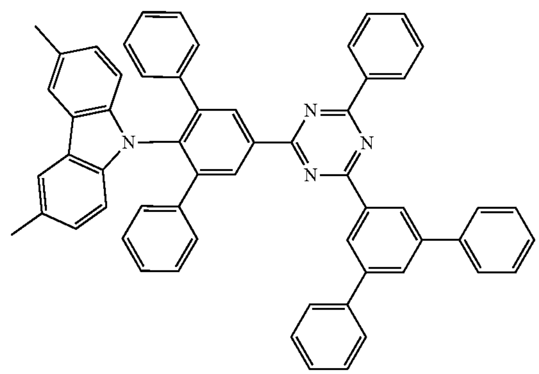

-continued
627
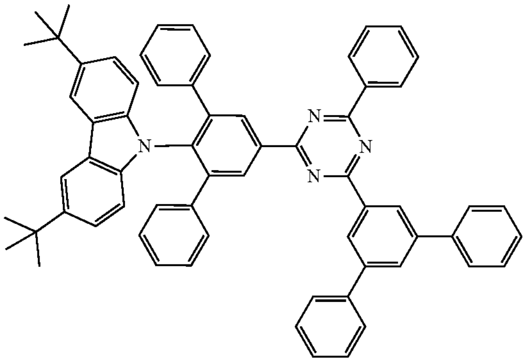
628
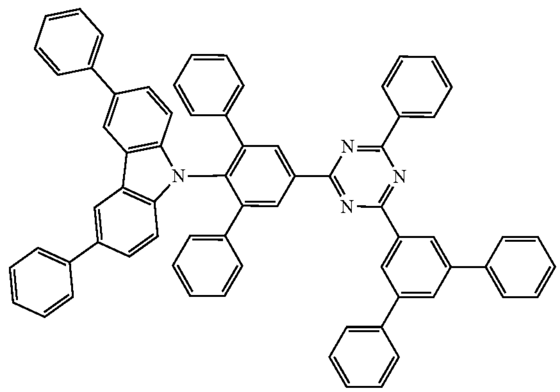
629
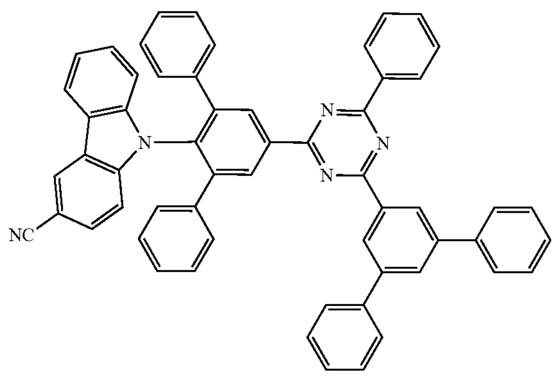
630
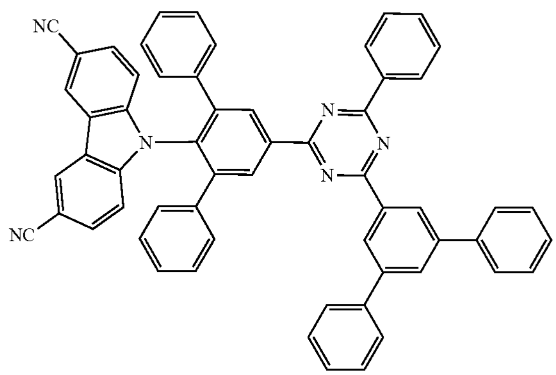
631
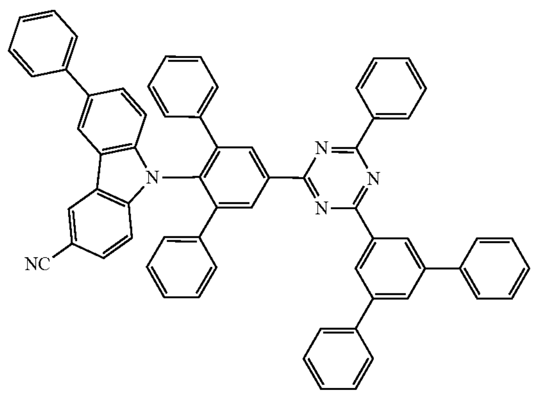
632
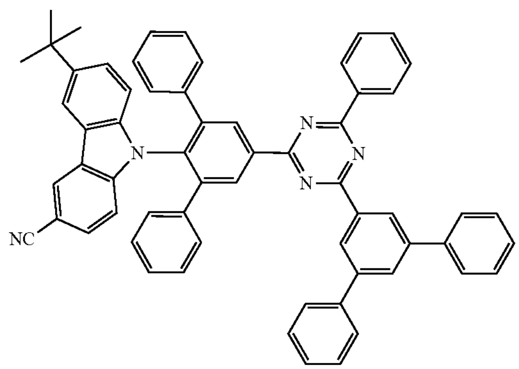
633
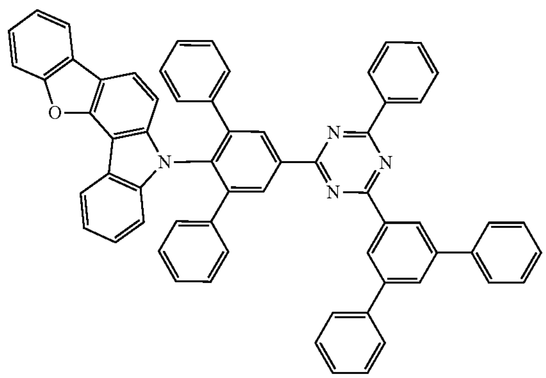
634
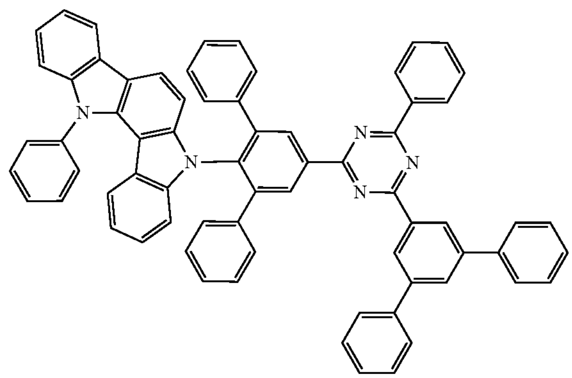

-continued
635
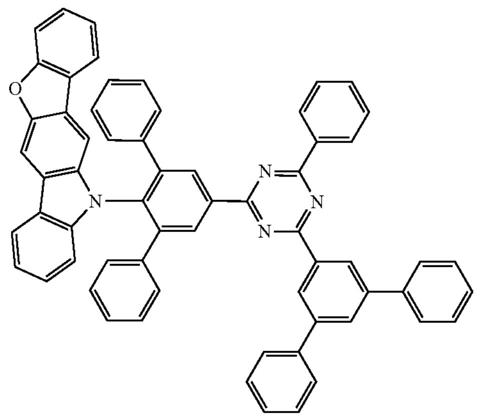
636
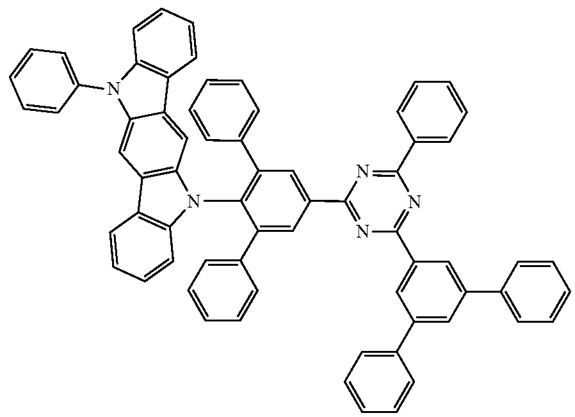
637
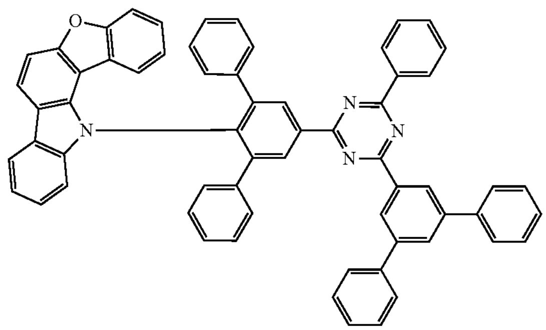
638
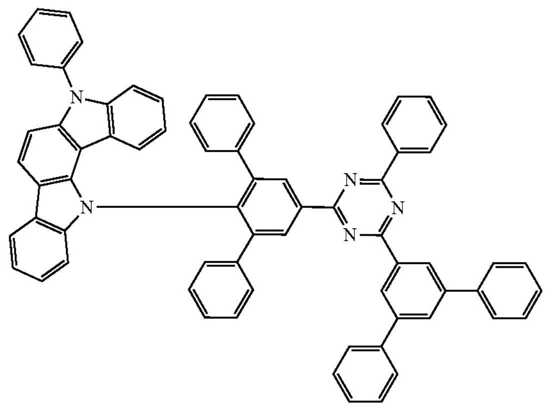
639
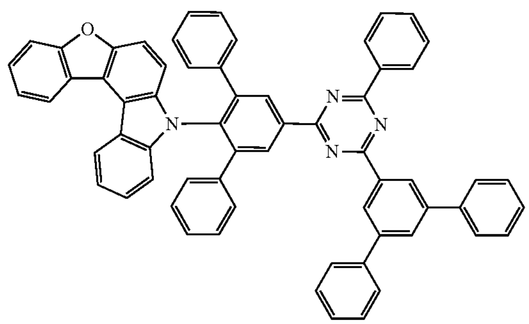
640
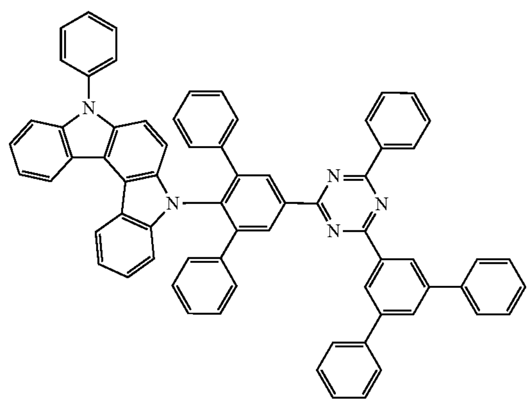

-continued
641
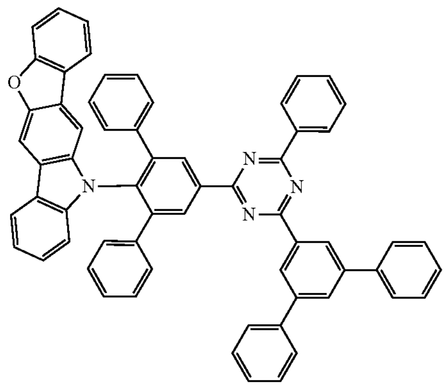
642
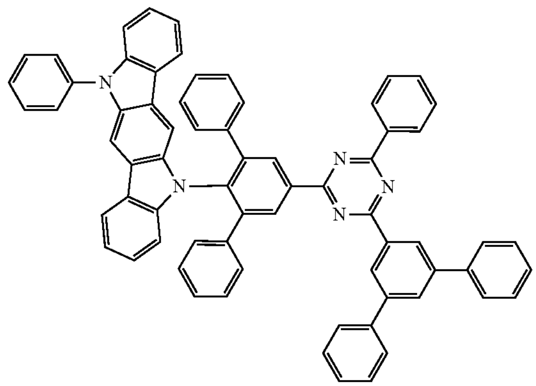
643
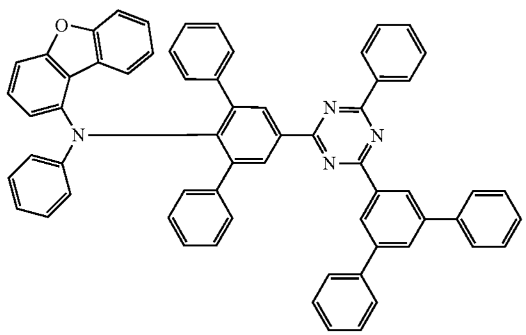
644
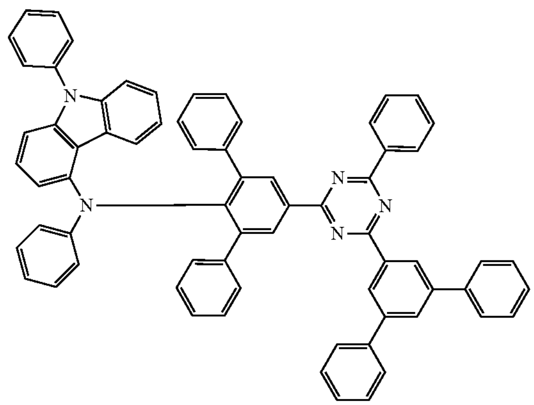
645
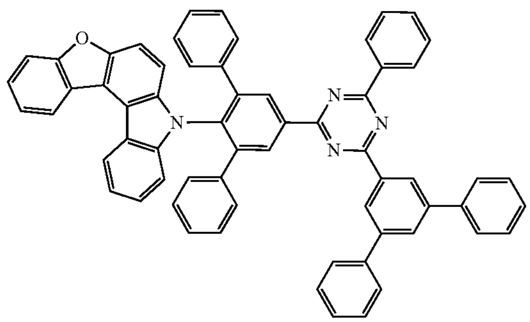
646
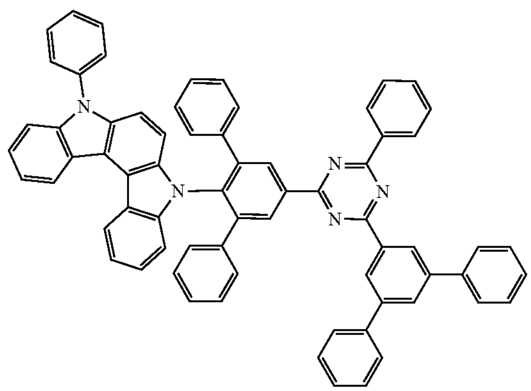
647
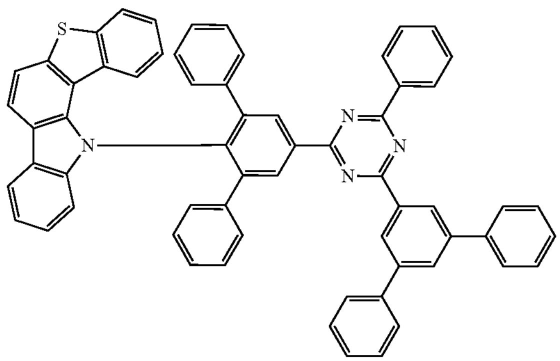
648
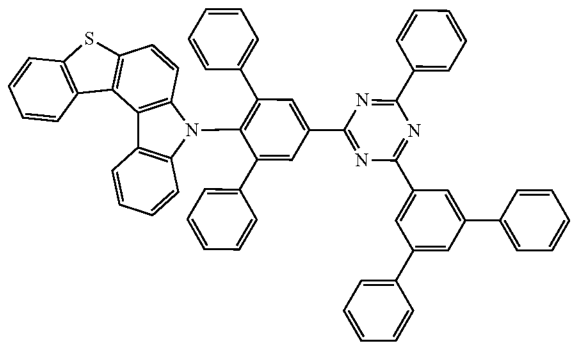

-continued
649
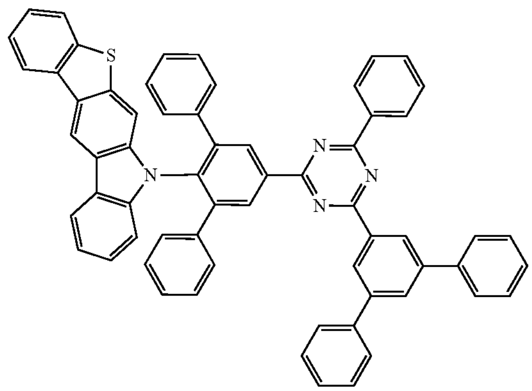
650
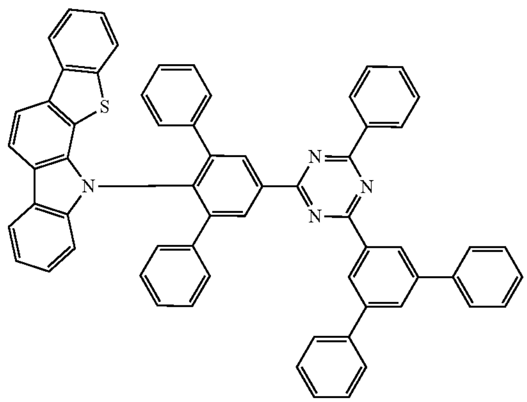
651
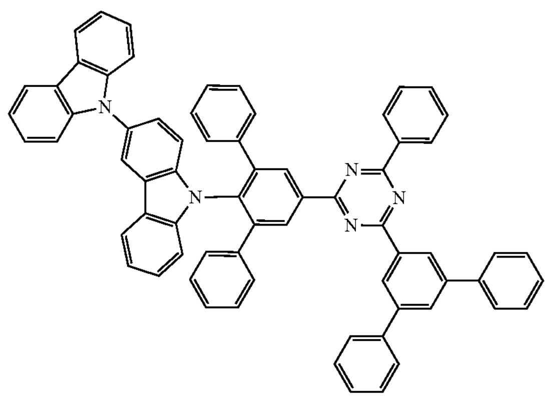
652
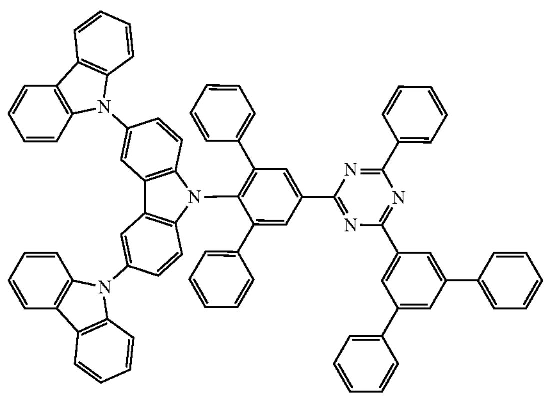
653
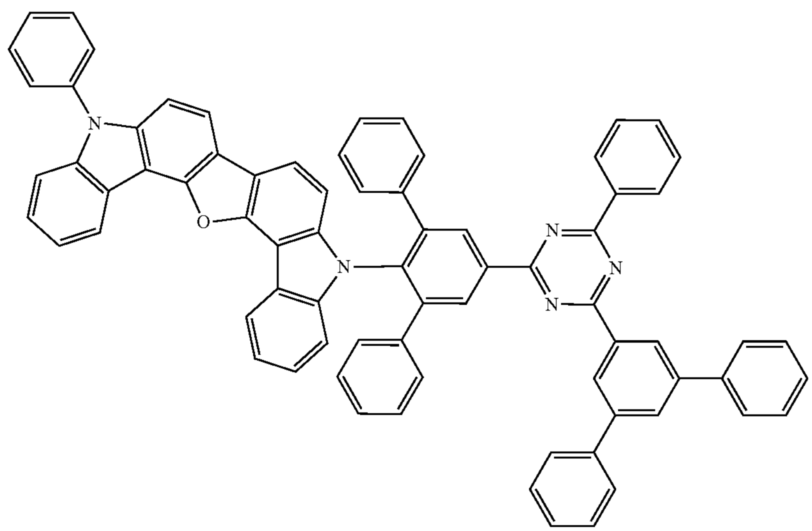

-continued
654
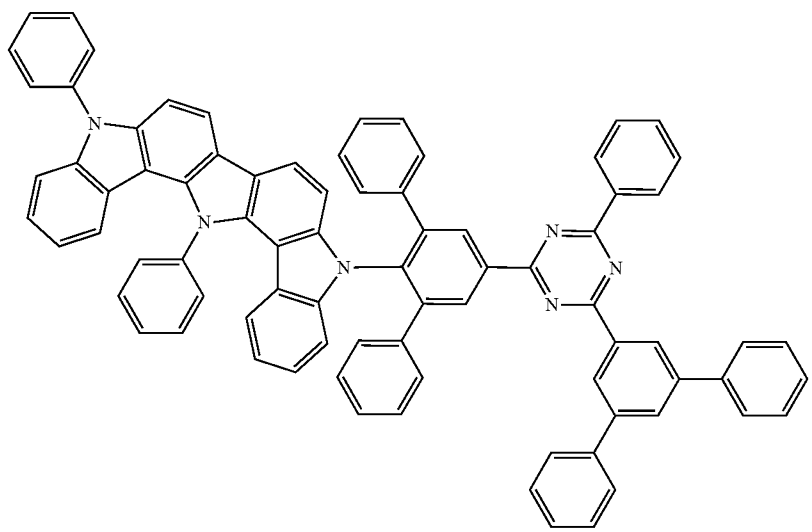
655
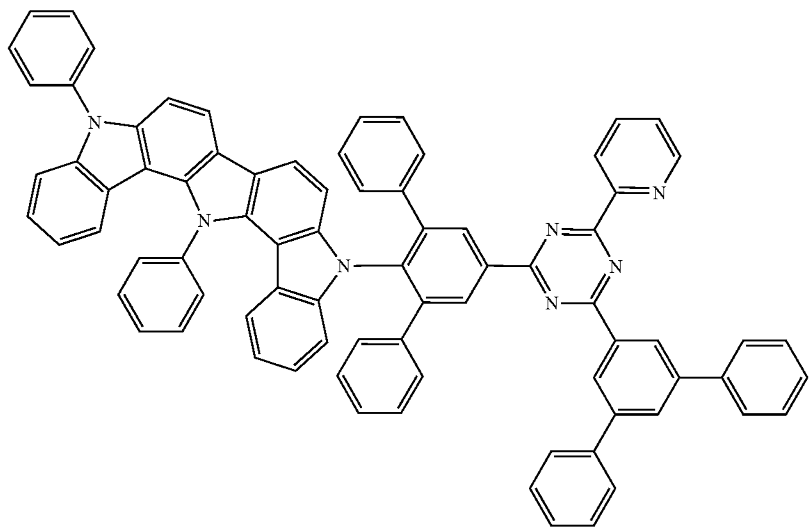
656
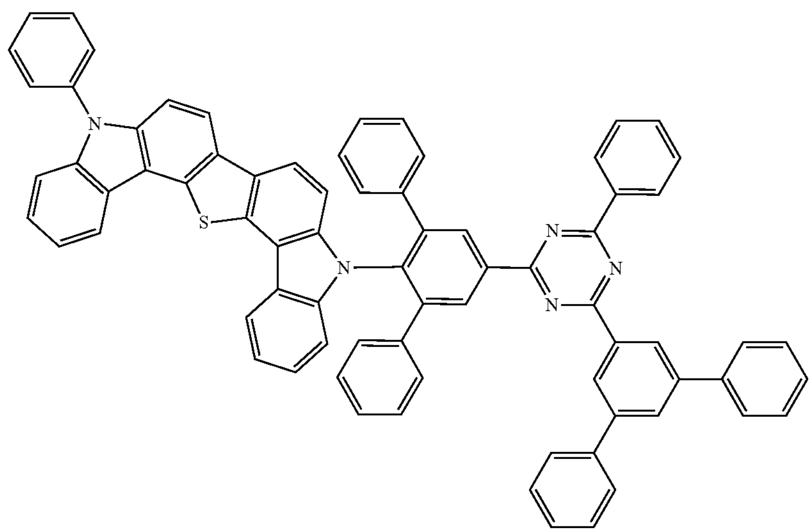

-continued
657
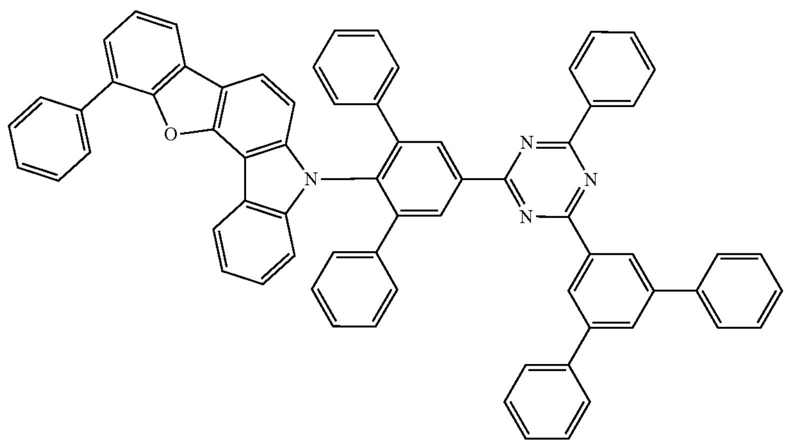
658
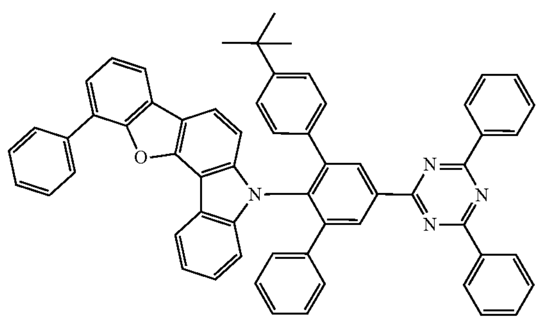
659
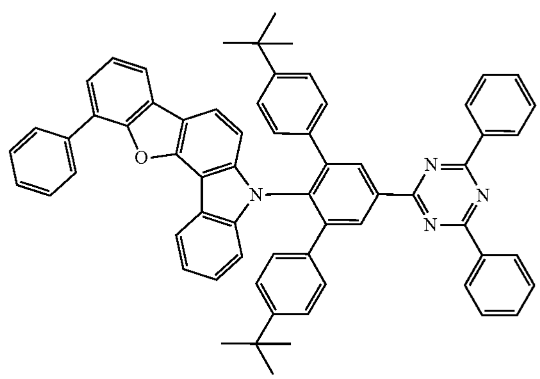
660
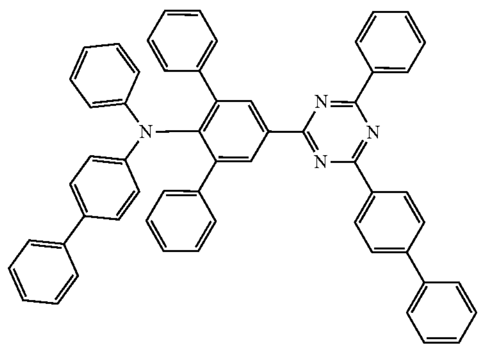
661
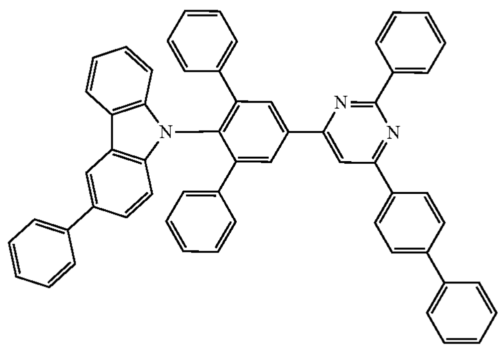
662
663
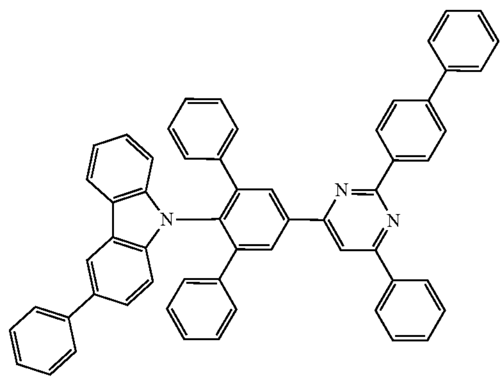
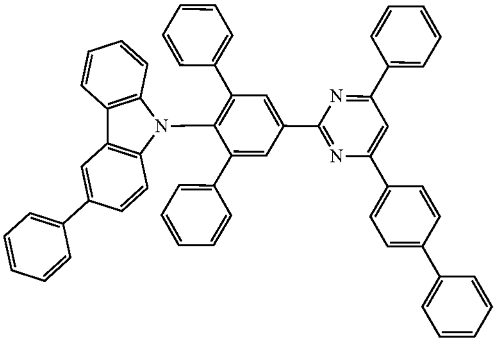

-continued
664
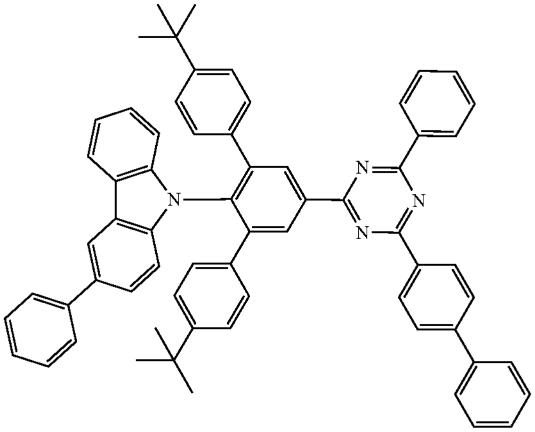
665
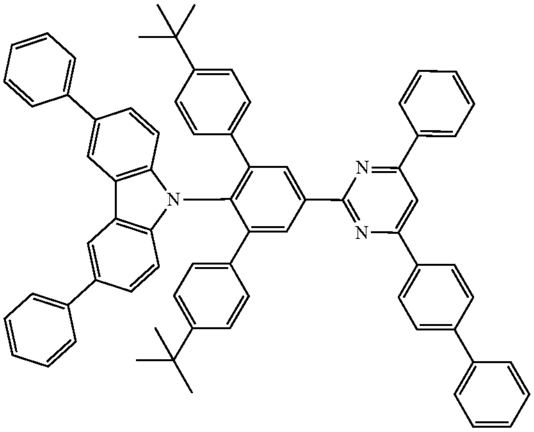
666
667
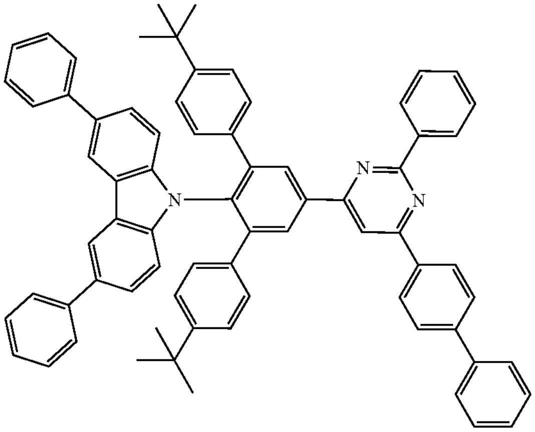
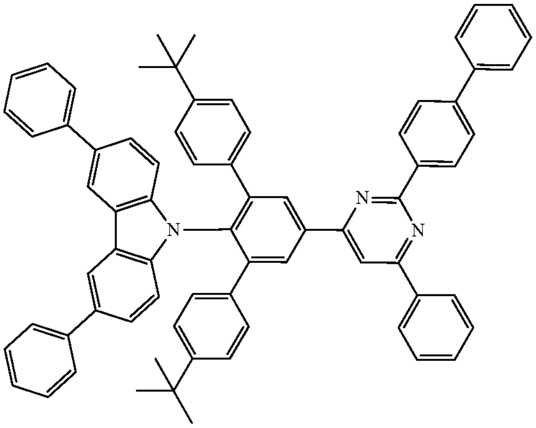
-continued
668
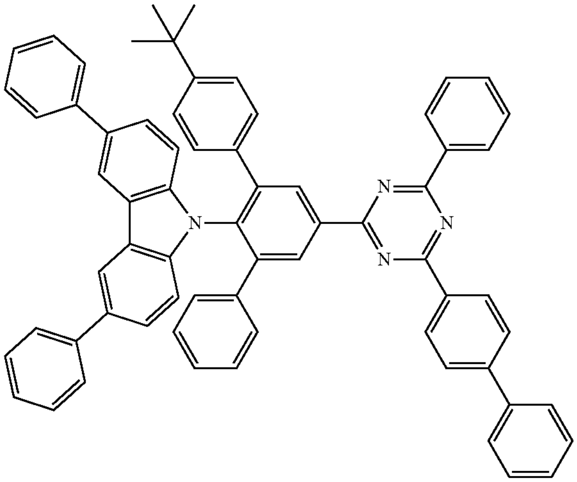
669
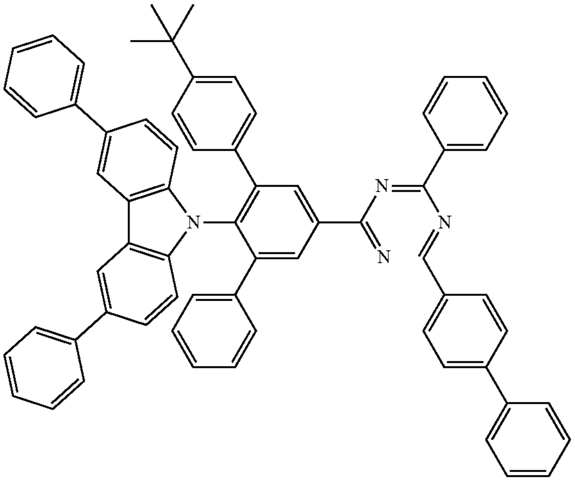

-continued
670
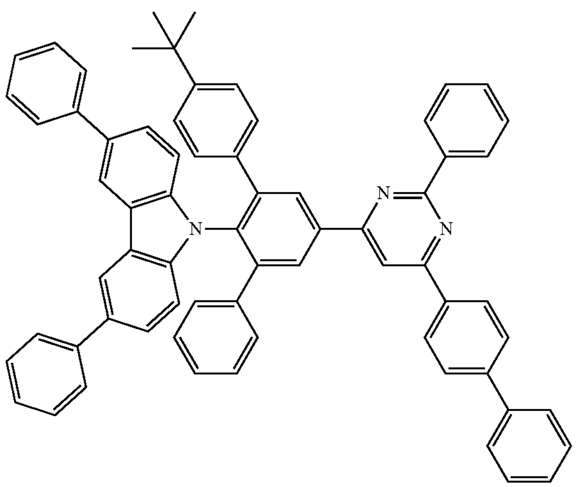
671
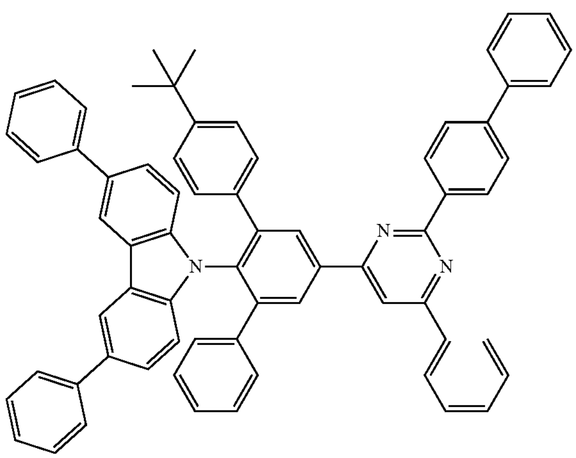
672
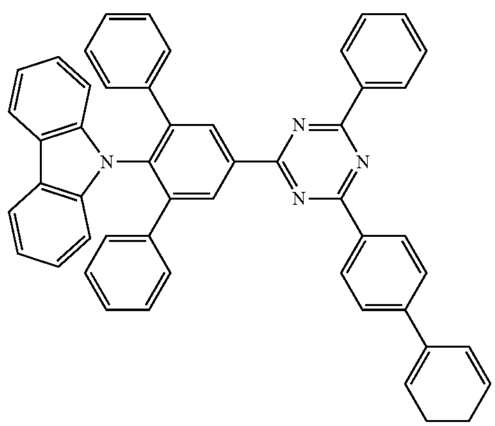
-continued
673
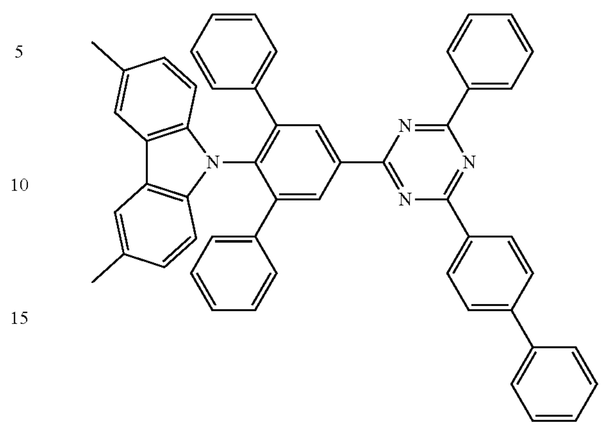
674
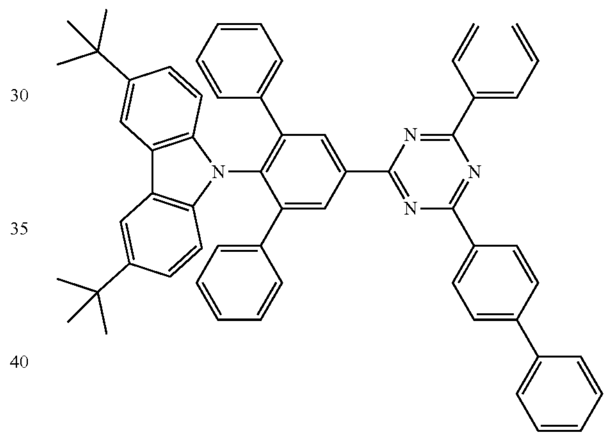
675
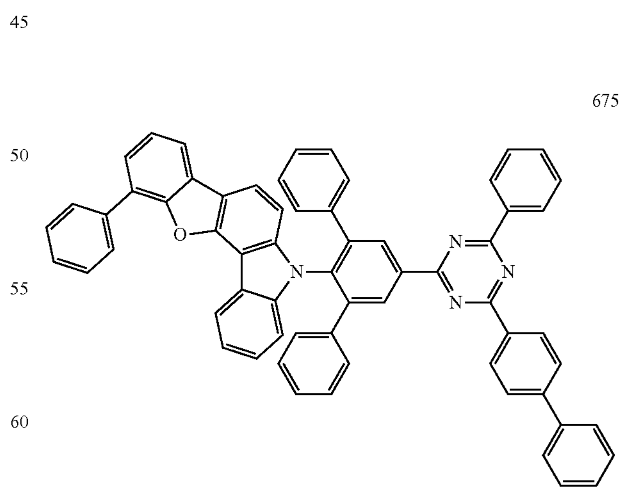

-continued
676
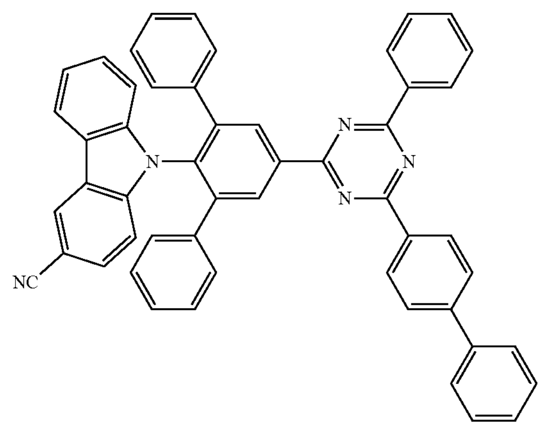
677
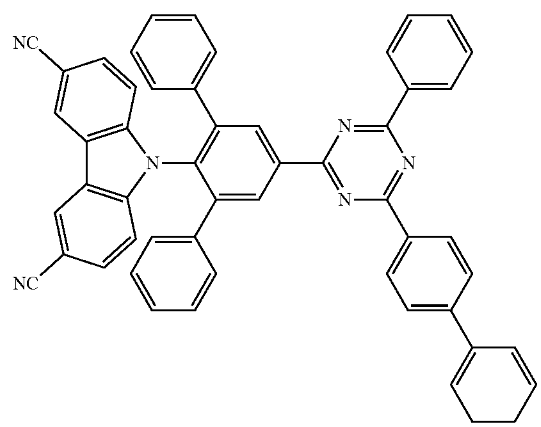
678
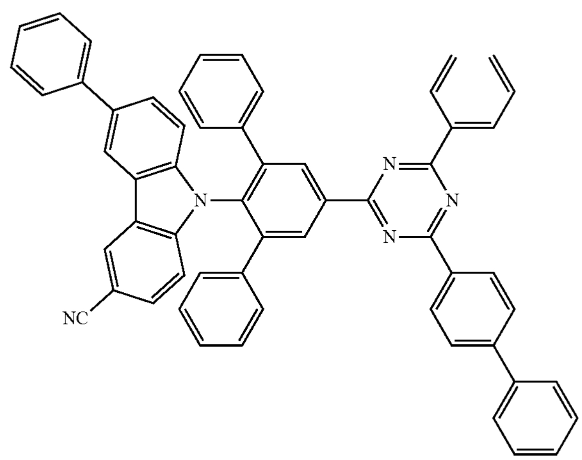
-continued
679
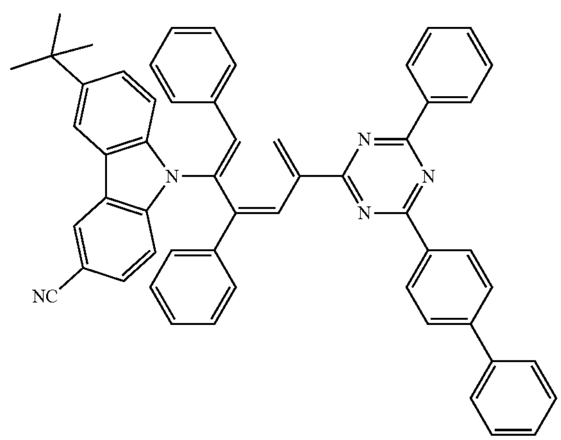
680
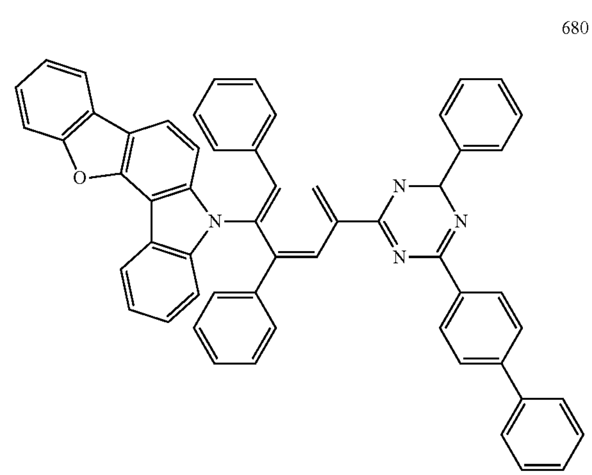
681
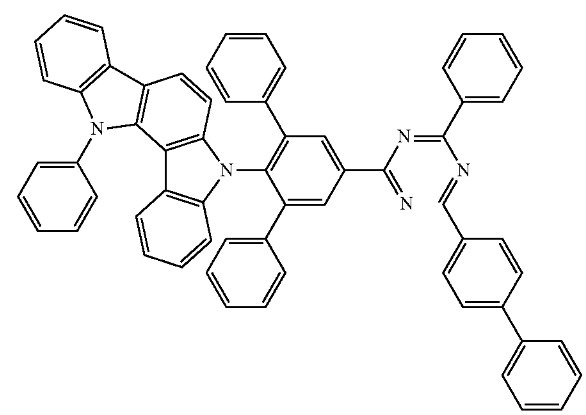

-continued
682
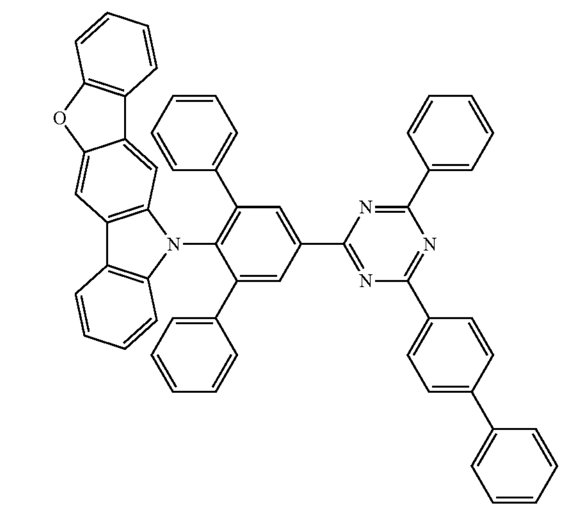
683
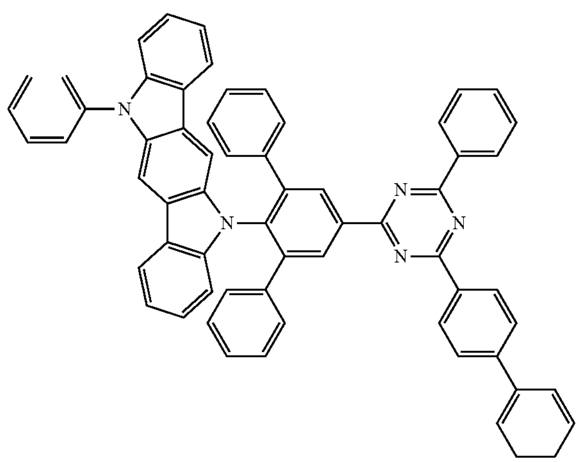
684
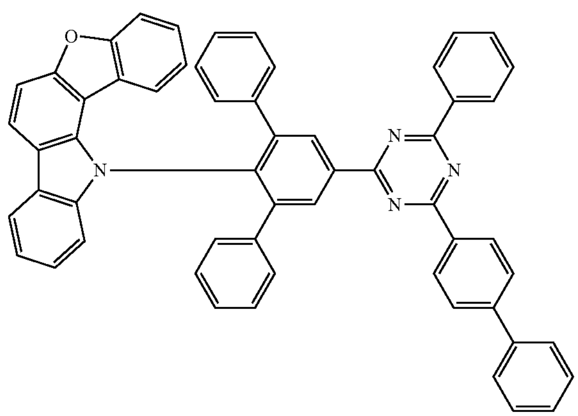
-continued
685
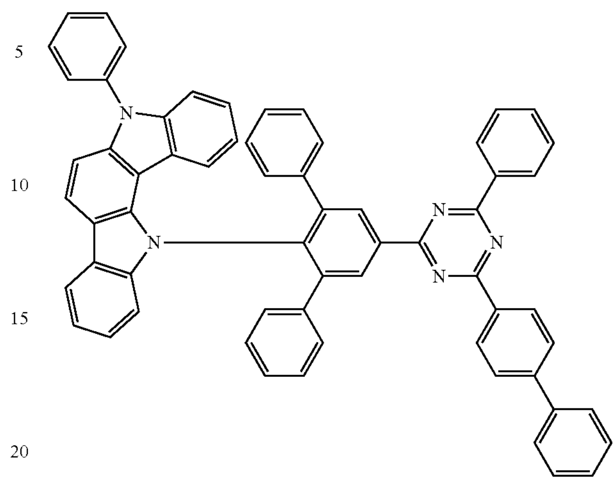
686
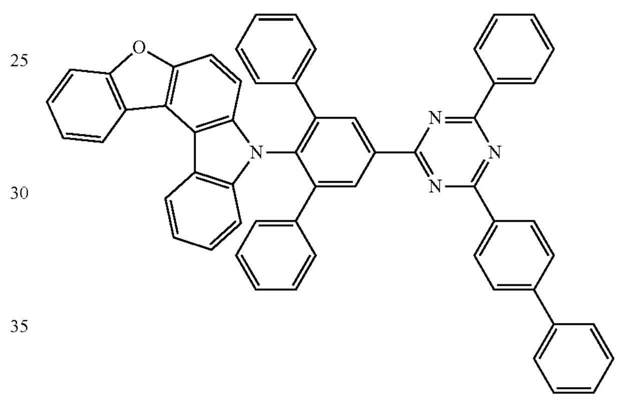
687
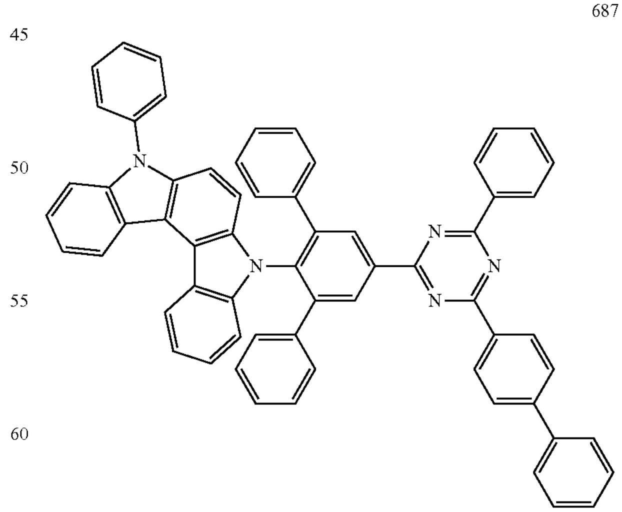

-continued
688
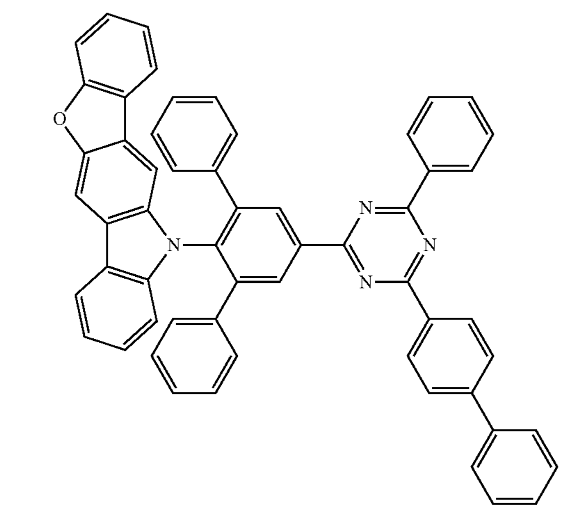
689
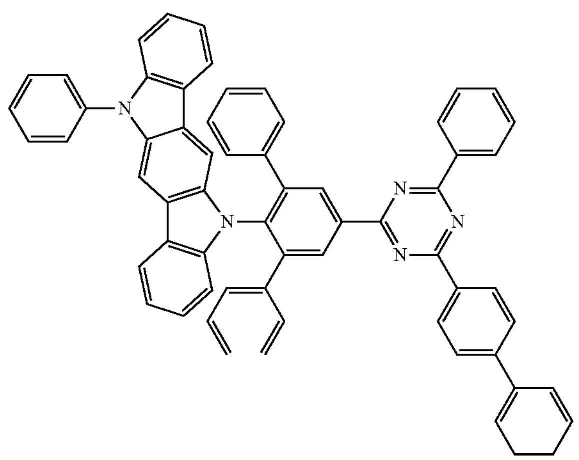
690
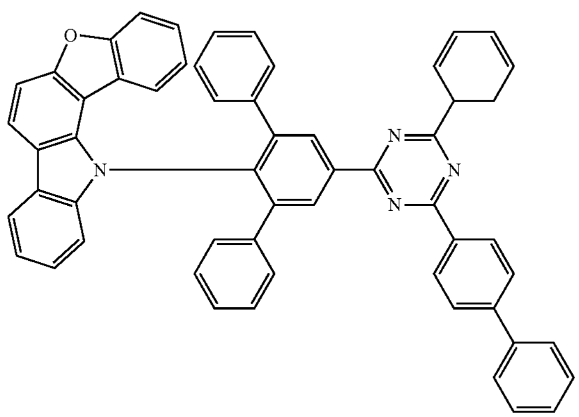
-continued
691
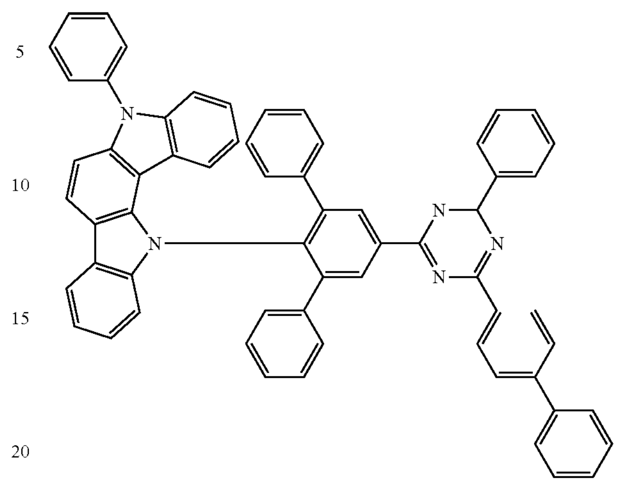
692
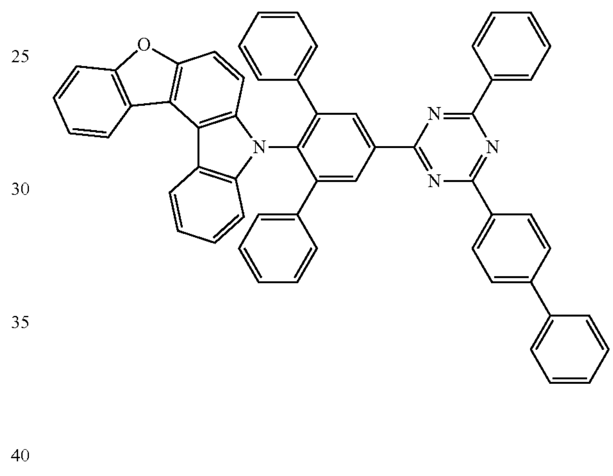
693
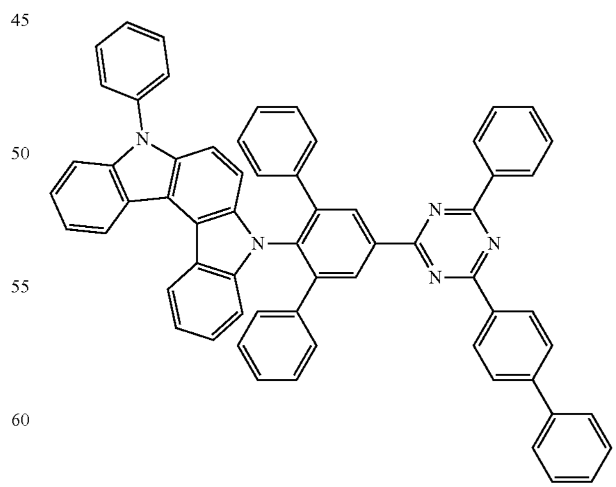

-continued
694
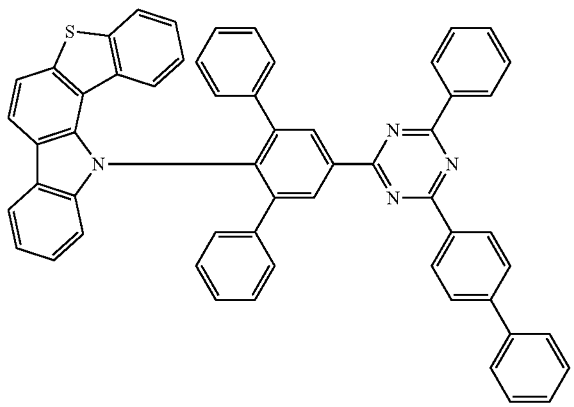
695
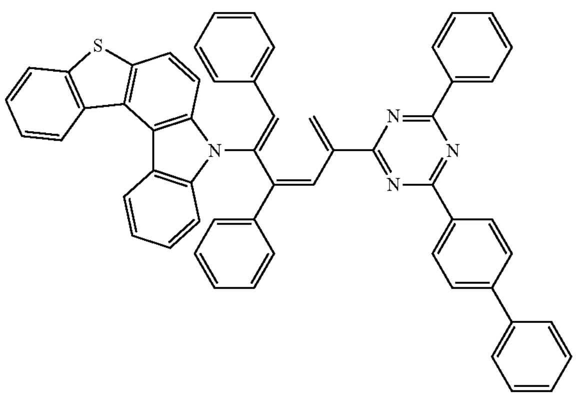
696
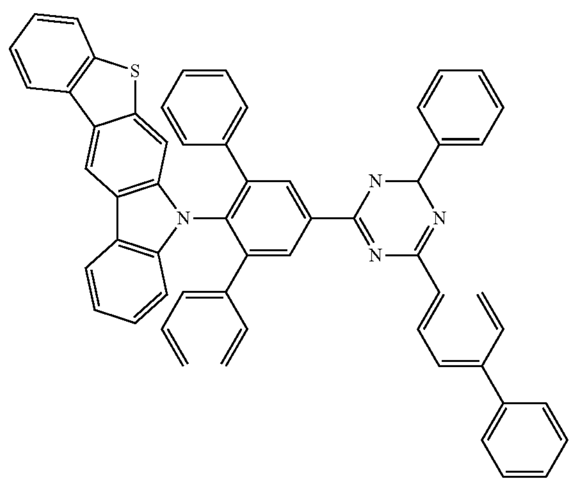
697
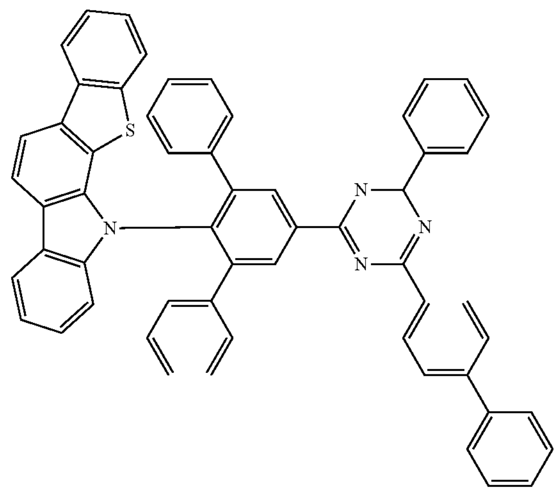
698
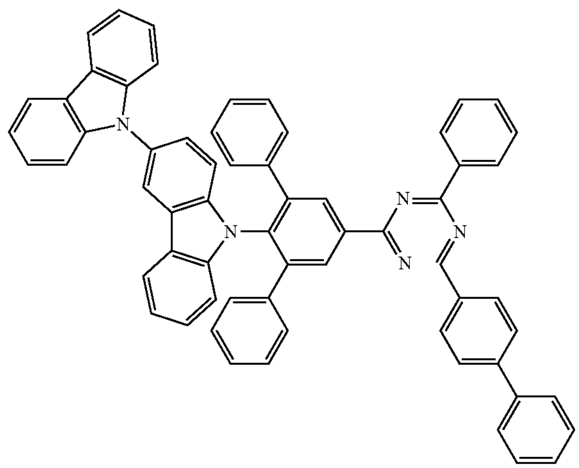
699
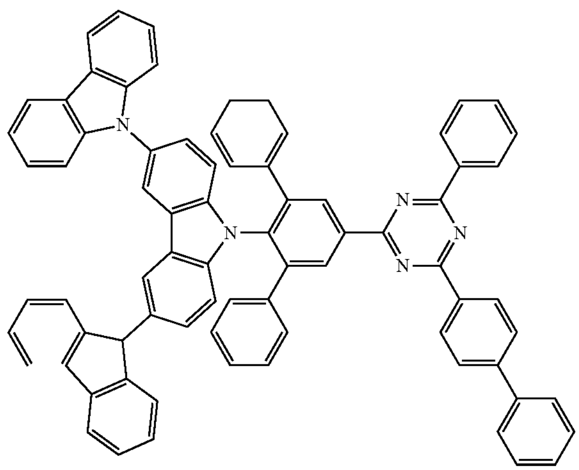

-continued
700
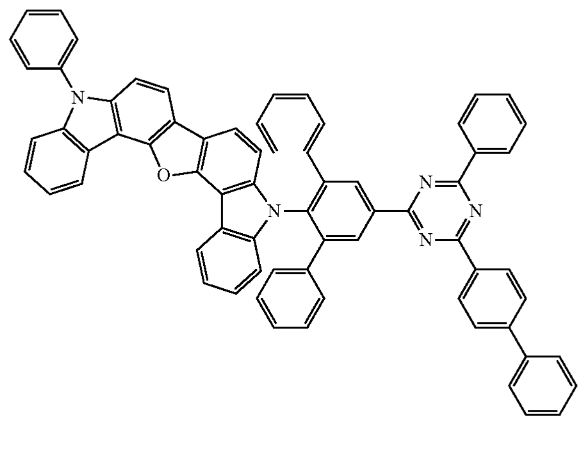
701
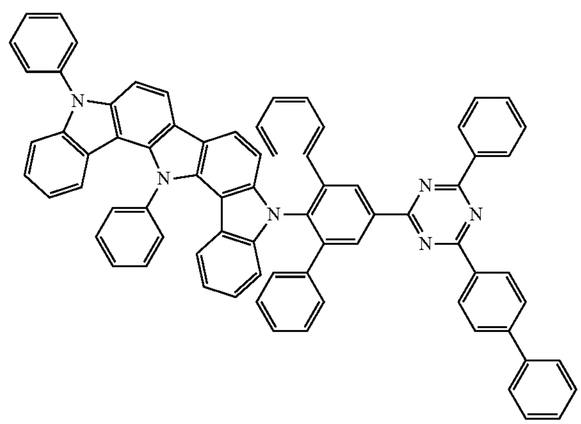
702
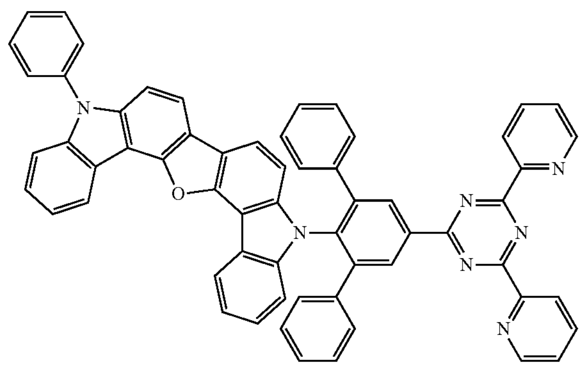
-continued
703
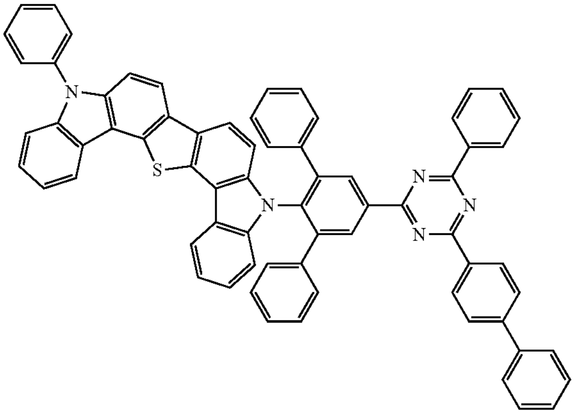
704
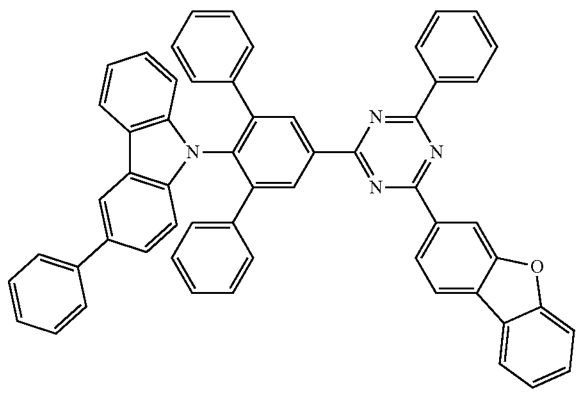
705
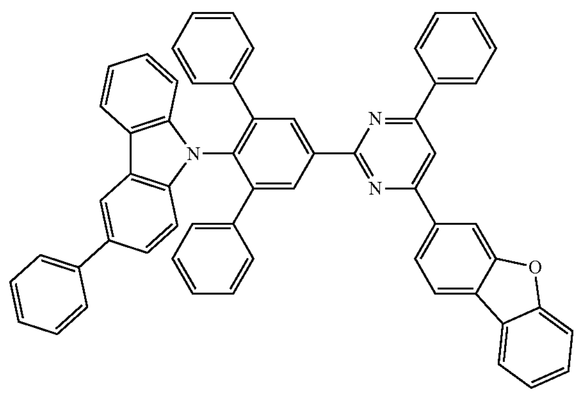

-continued
706
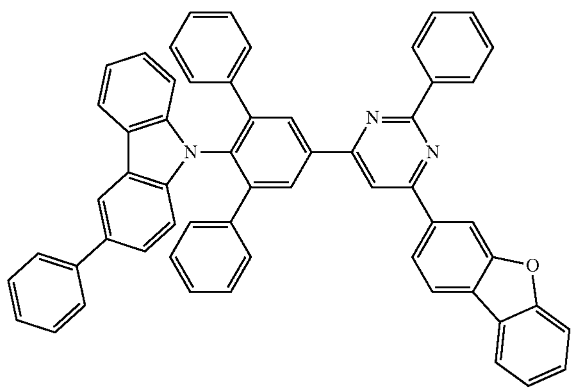
707
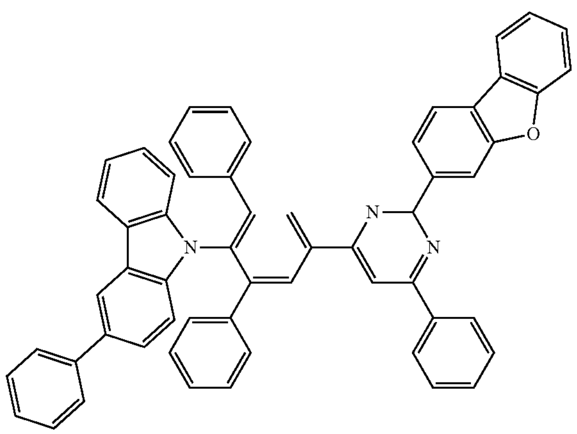
708
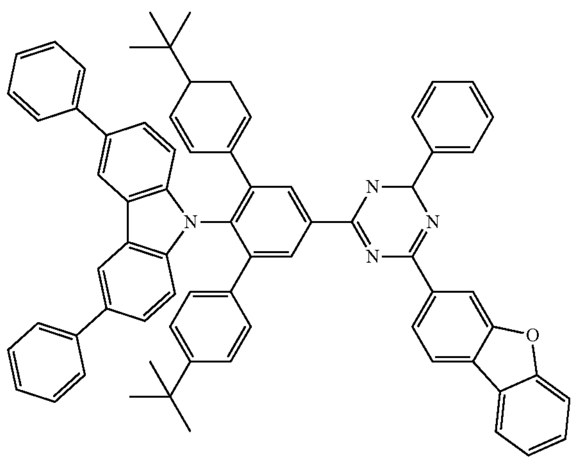
-continued
709
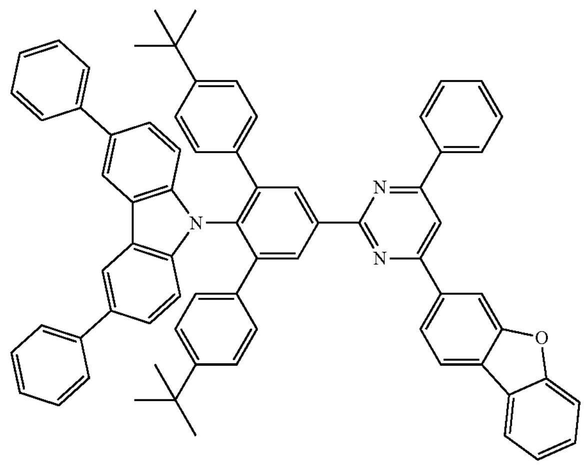
710
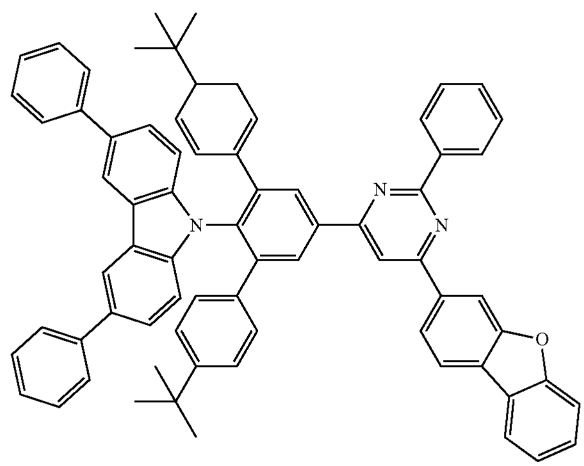
711
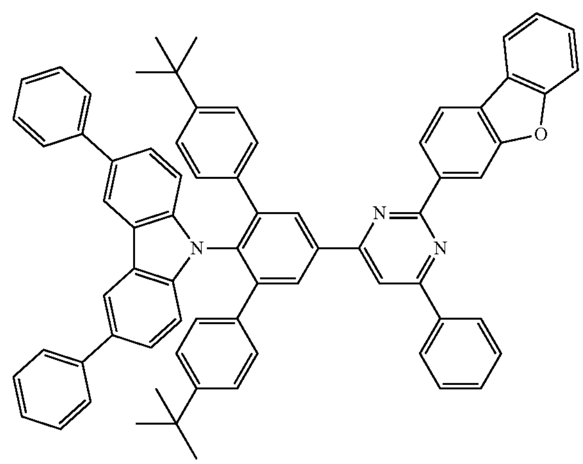

-continued
712
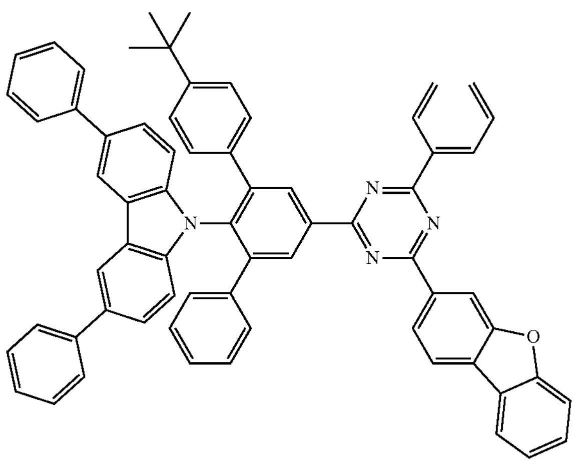
713
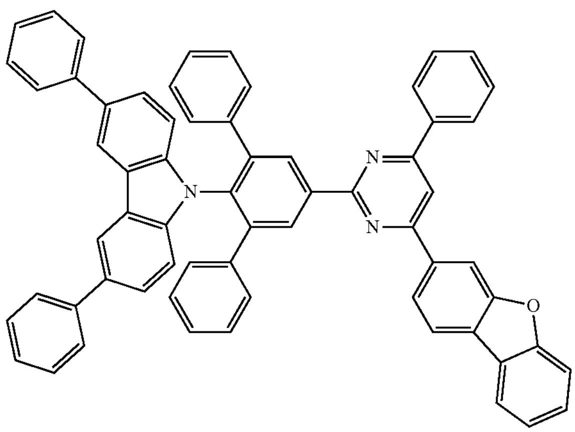
714
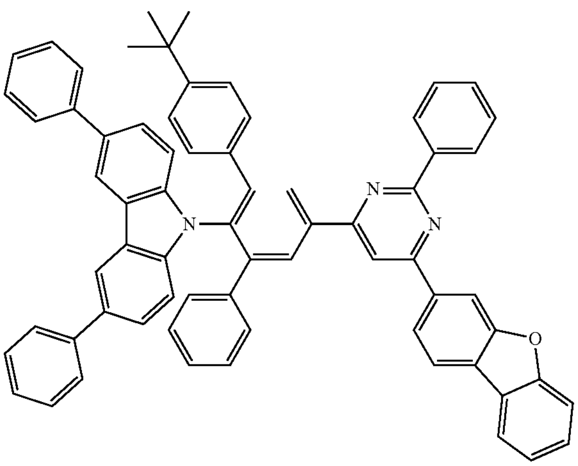
-continued
715
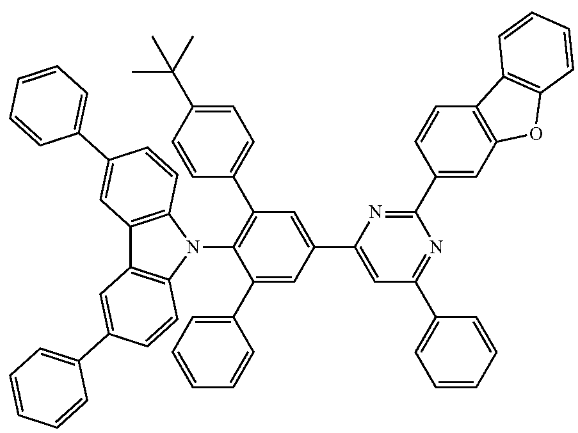
716
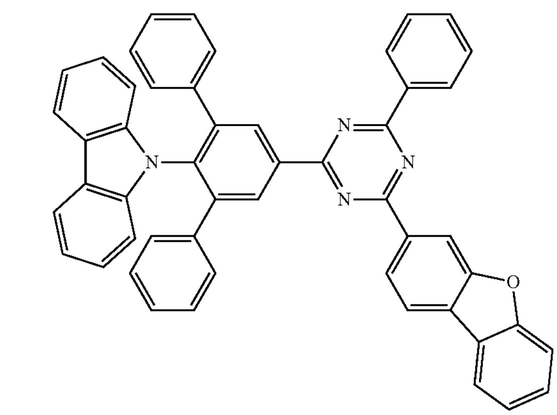
717
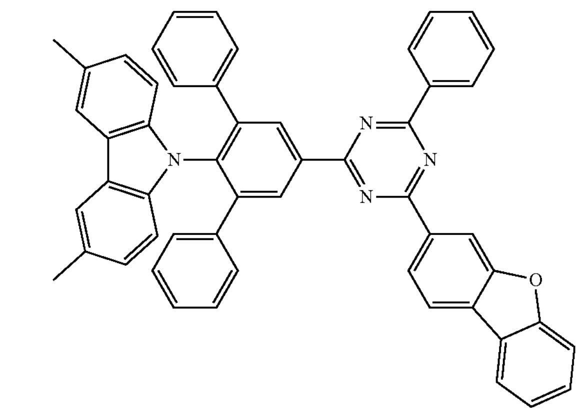

-continued
718
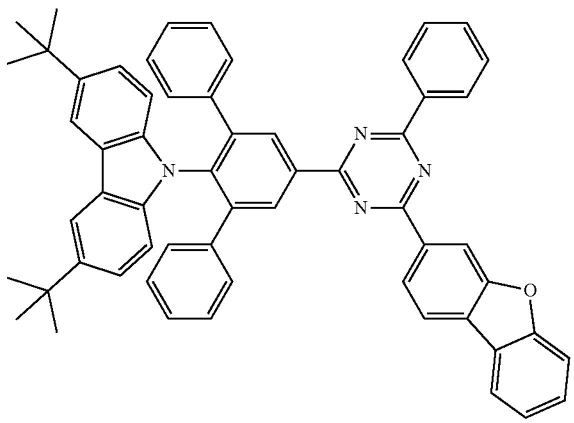
719
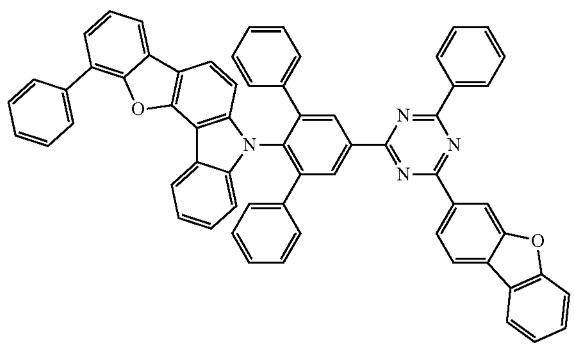
720
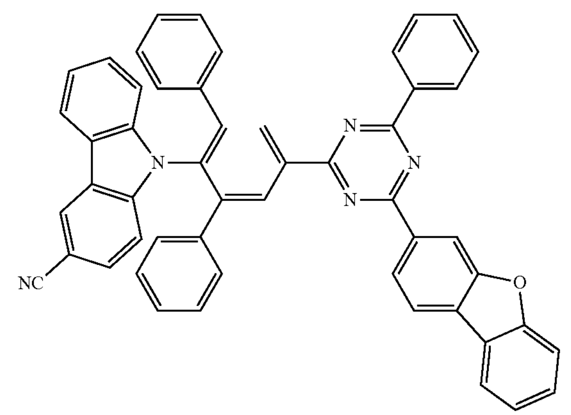
-continued
721
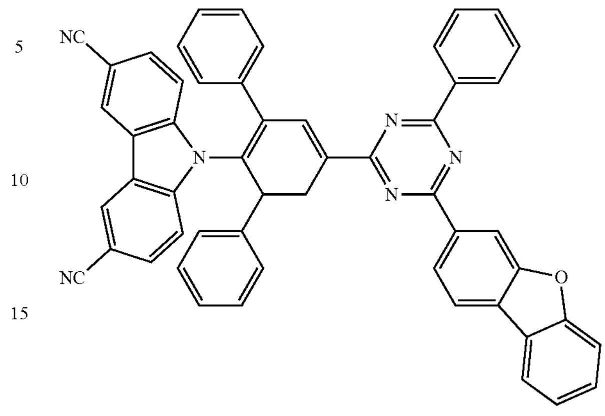
722
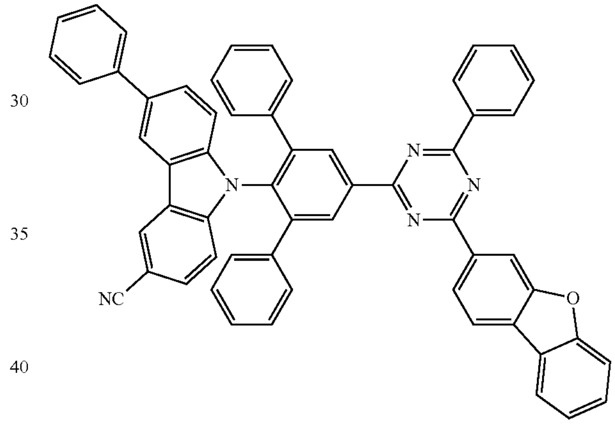
723
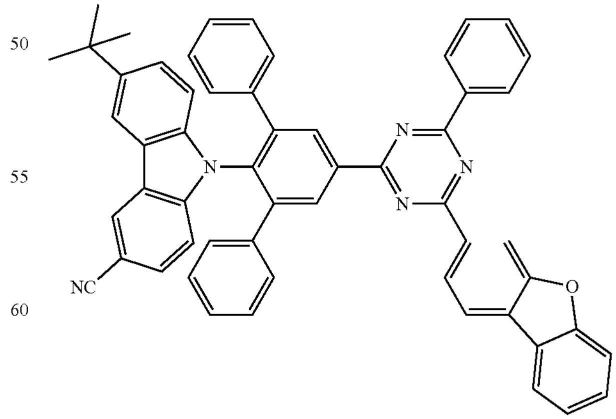

-continued
724
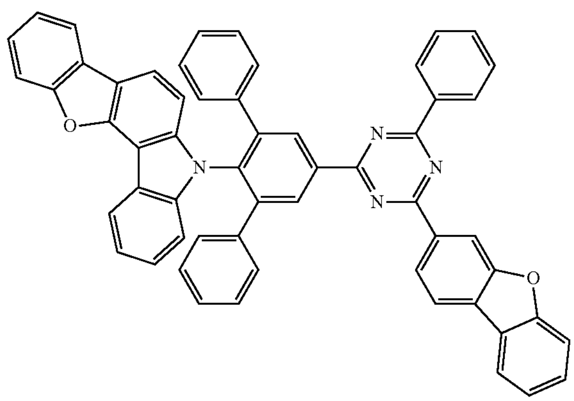
725
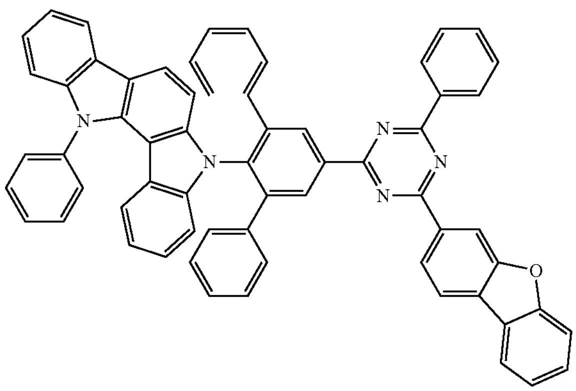
726
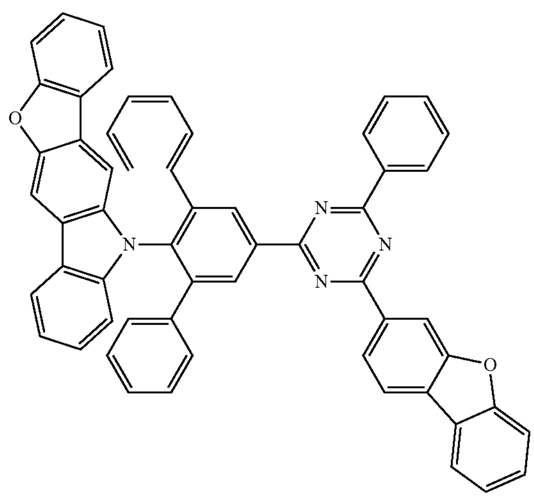
-continued
727
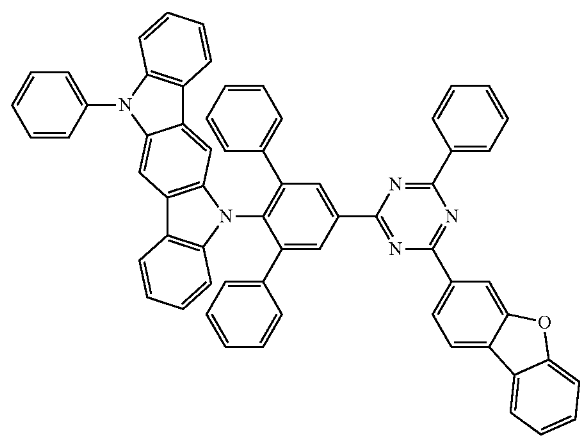
728
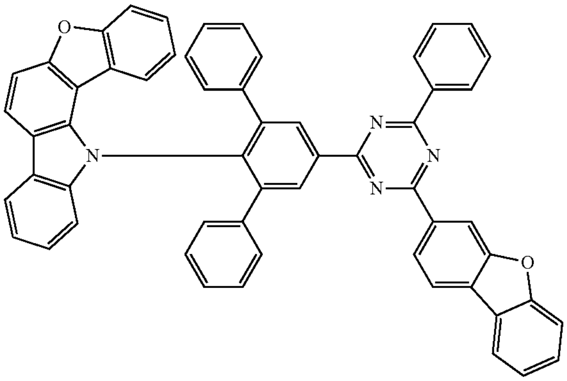
729
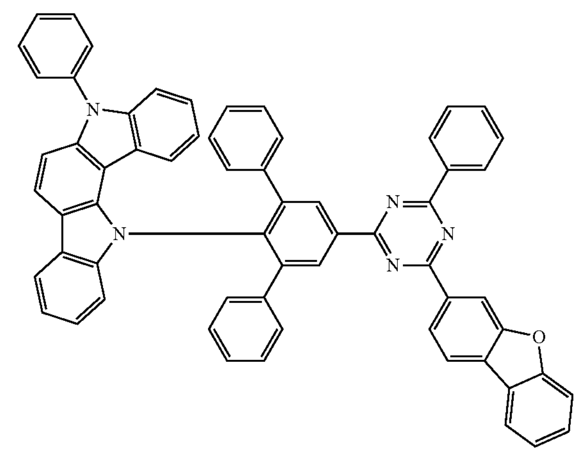

-continued
730
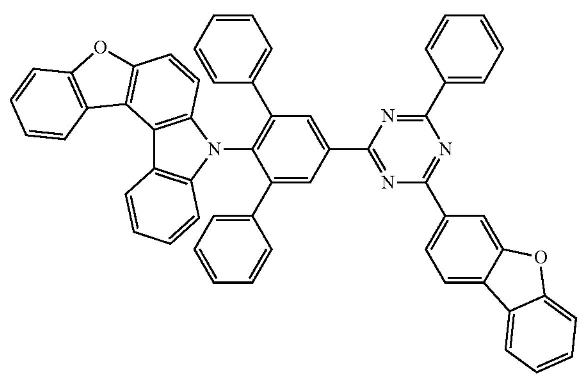
731
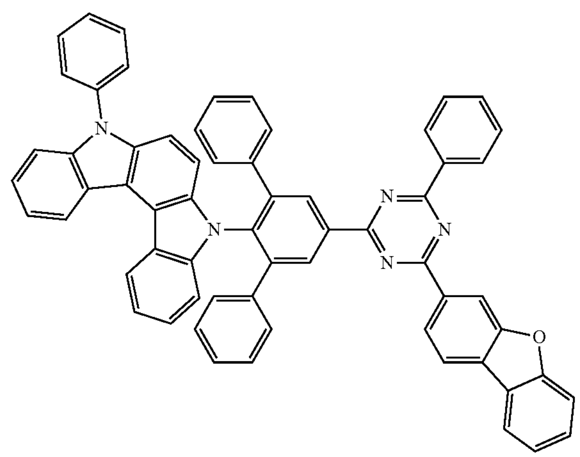
732
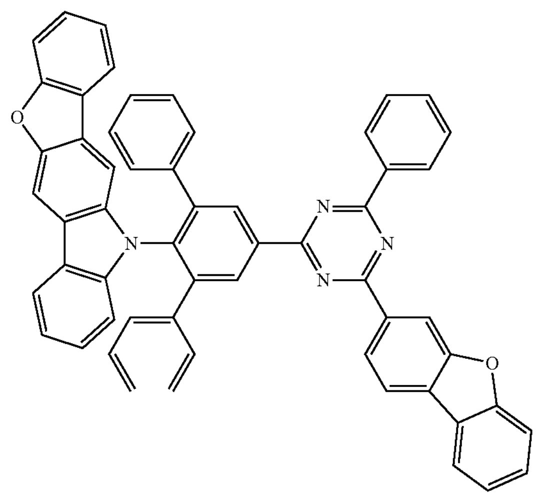
733
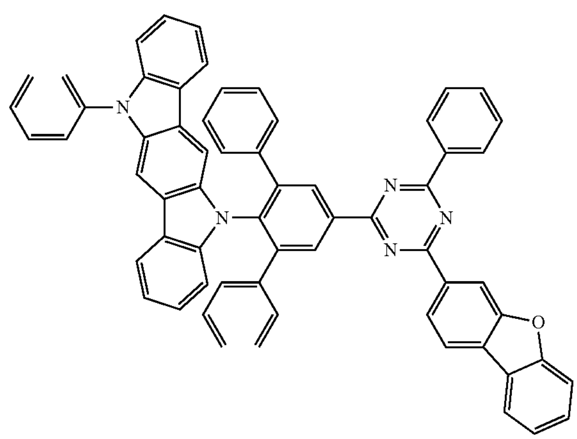
734
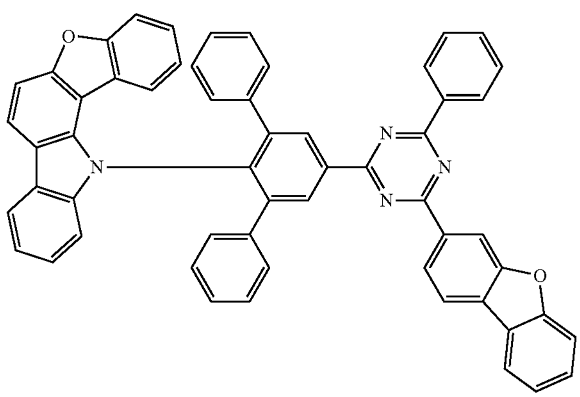
735
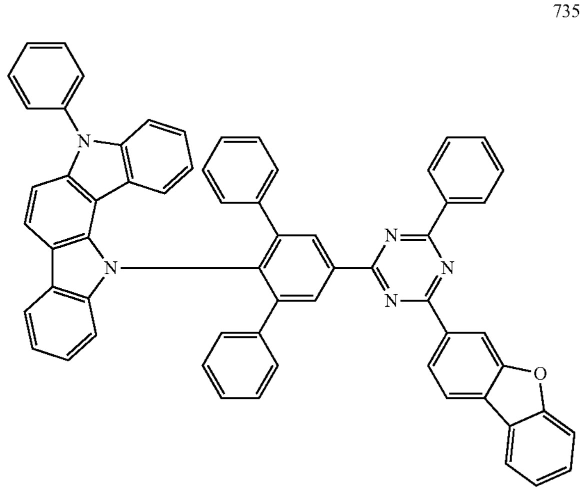

-continued
736
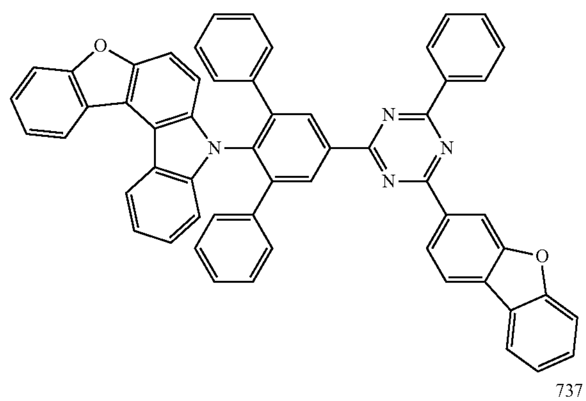
737
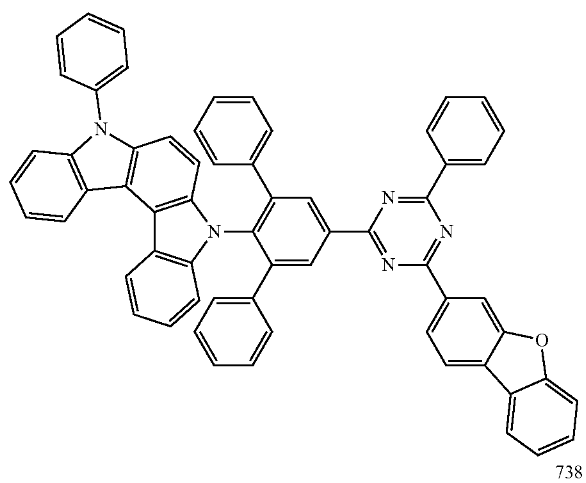
738
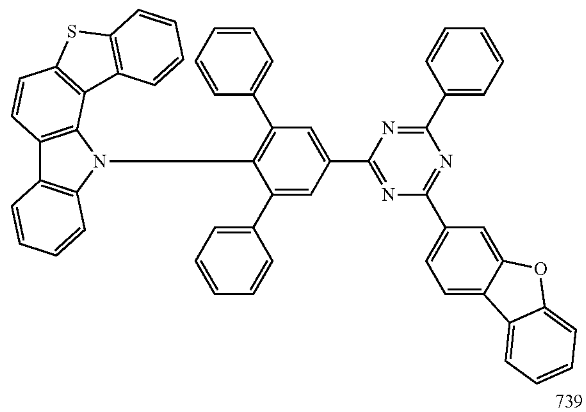
739
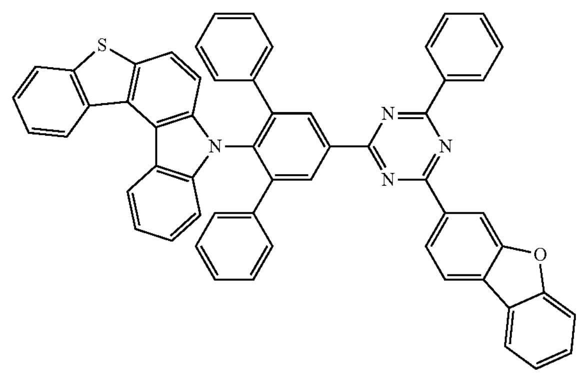
-continued
740
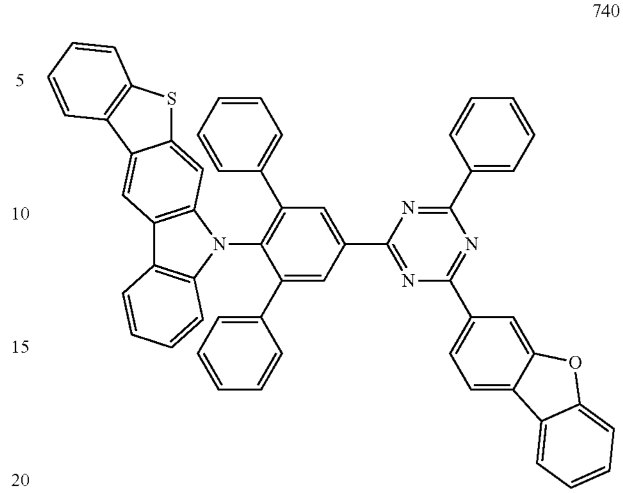
741
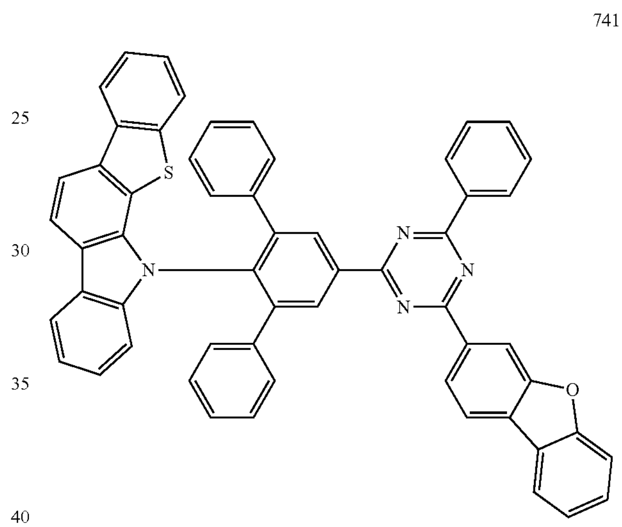
742
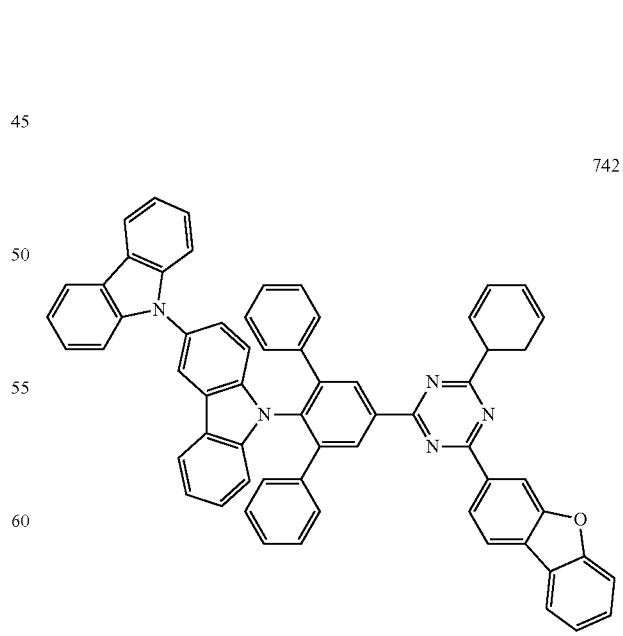

-continued
743
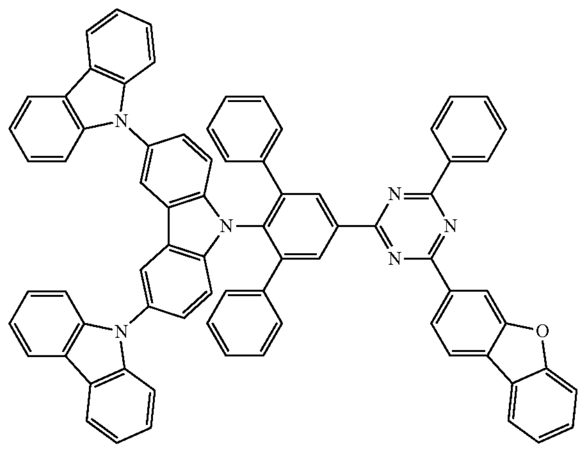
744
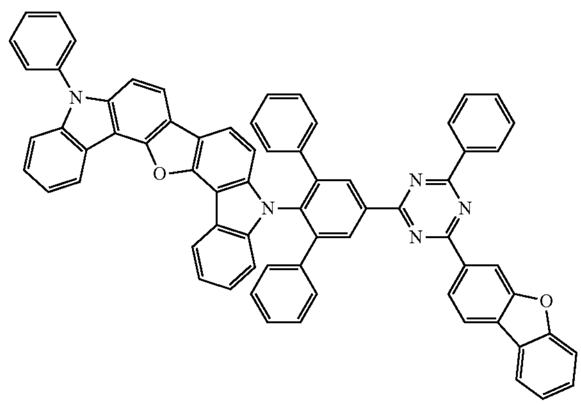
745
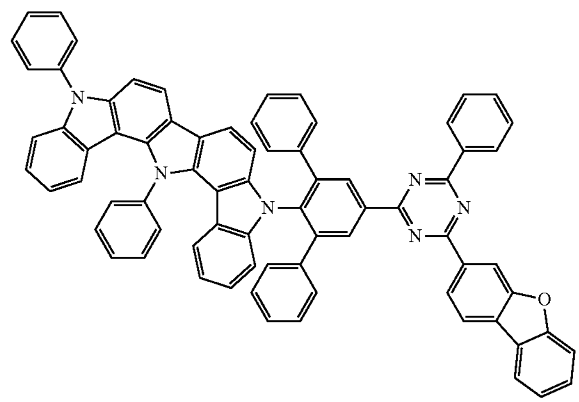
-continued
746
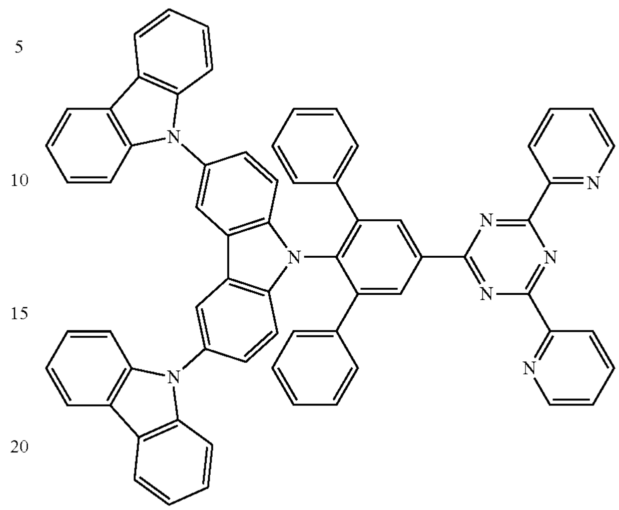
747
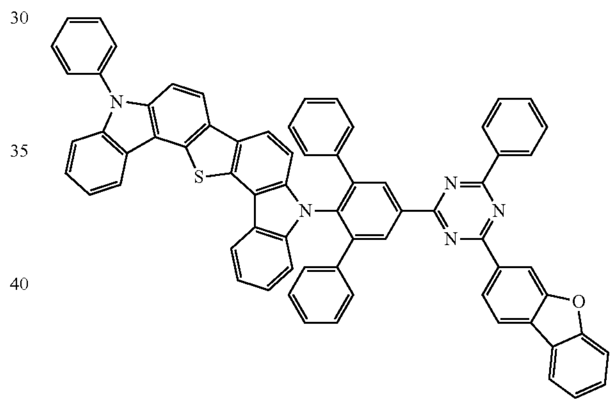
748
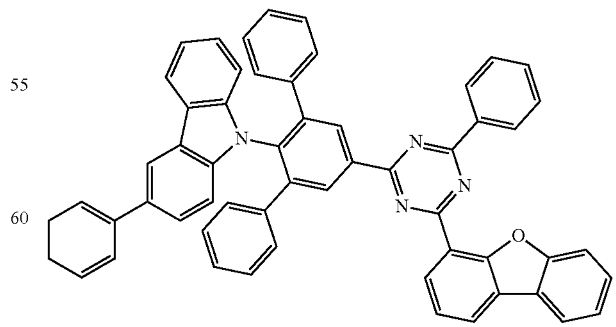

-continued
749
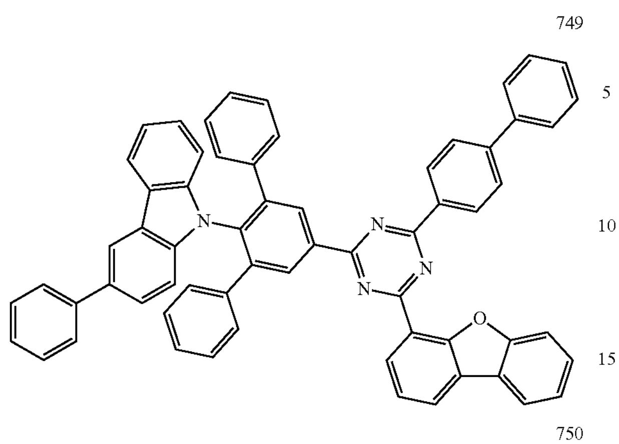
750
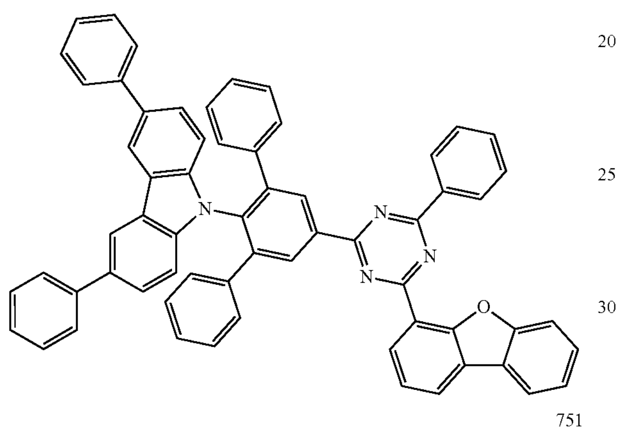
751
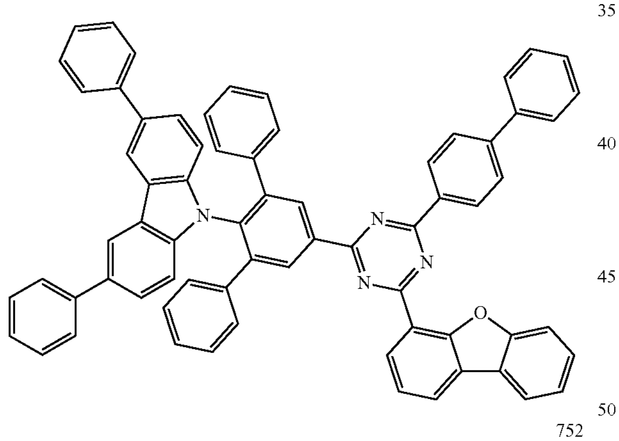
752
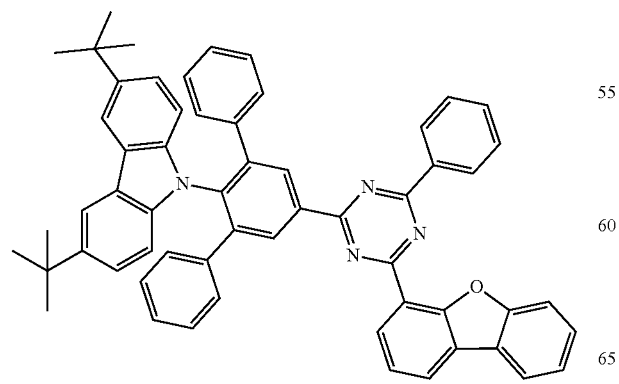
-continued
753
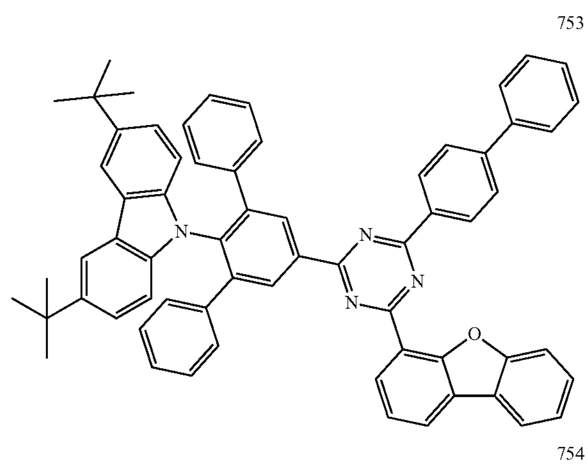
754
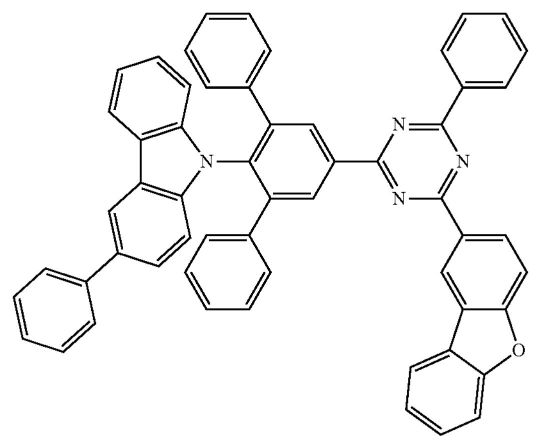
755
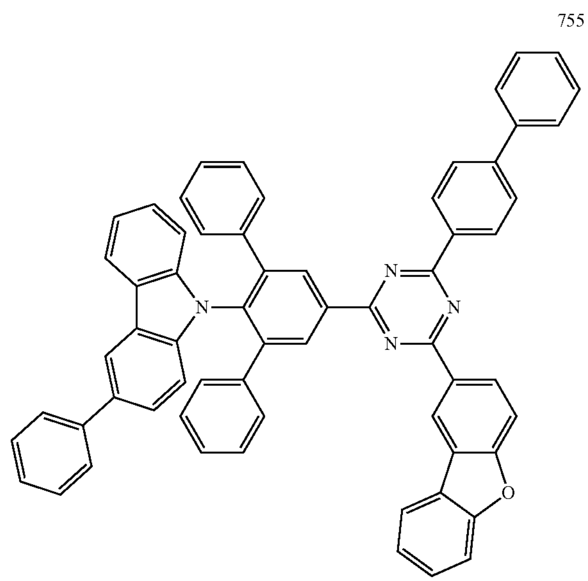

-continued
756
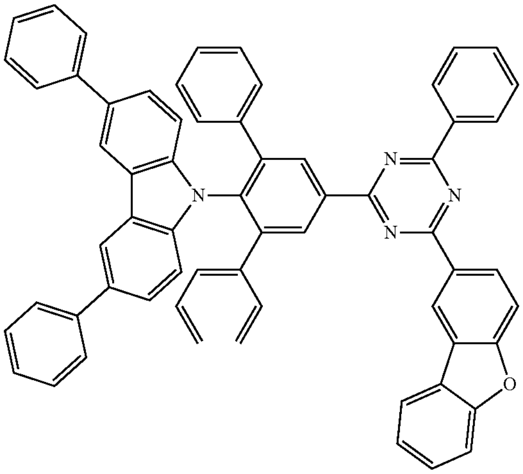
757
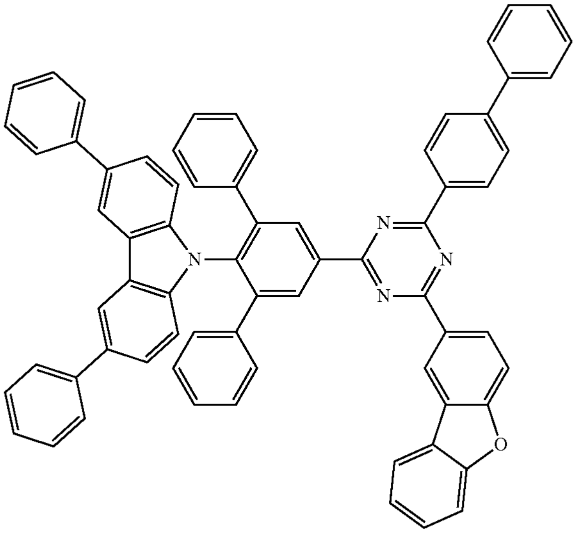
758
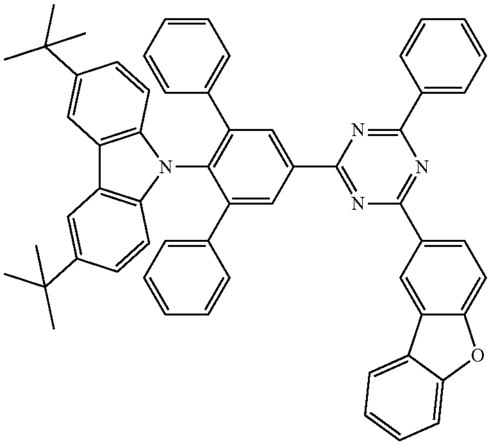
-continued
759
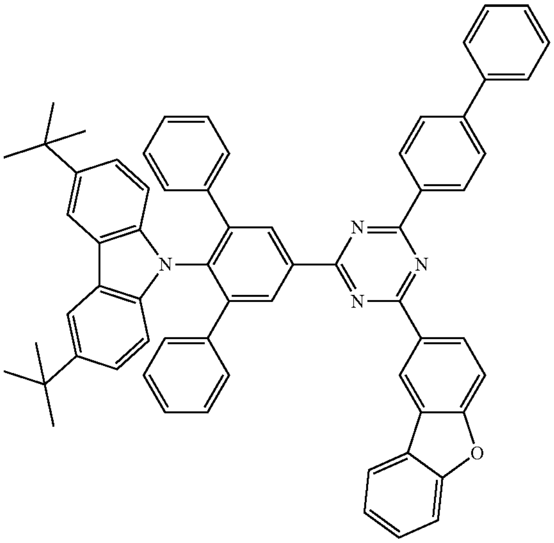
760
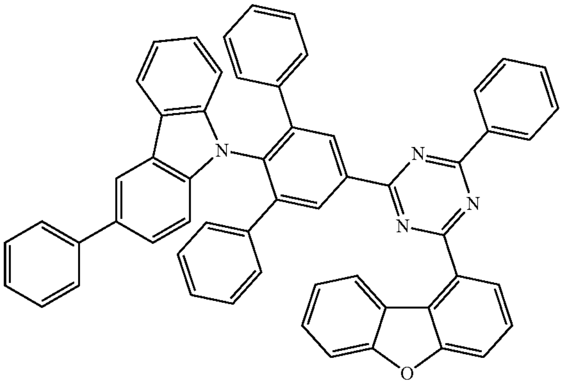
761
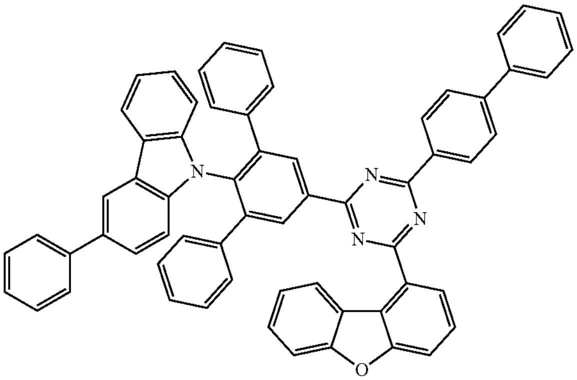

-continued
762
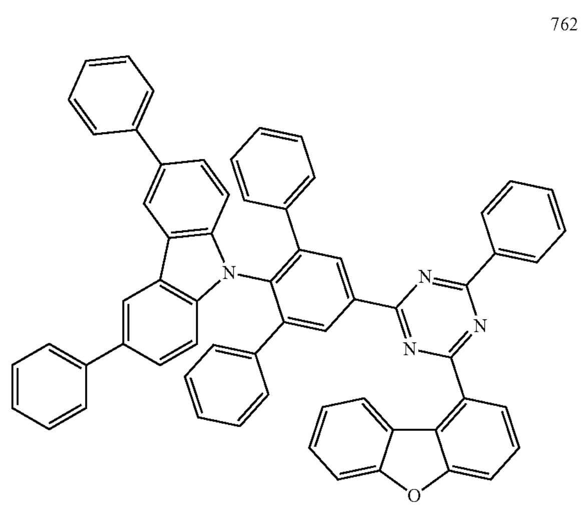
763
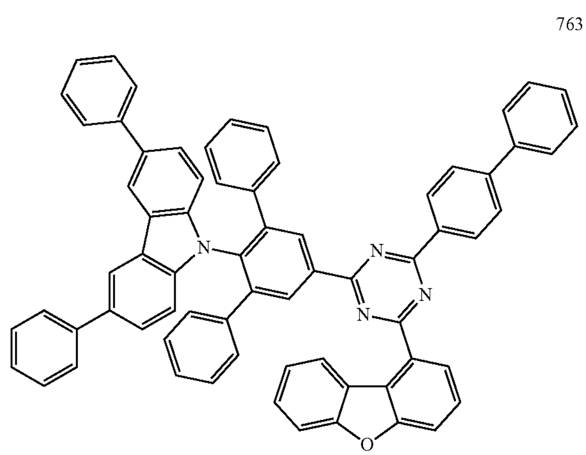
764
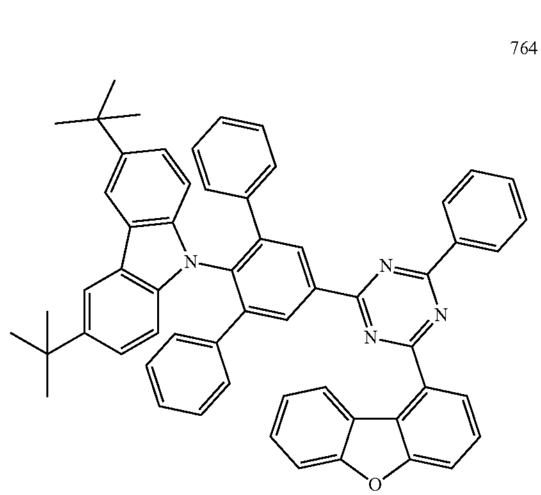
-continued
765
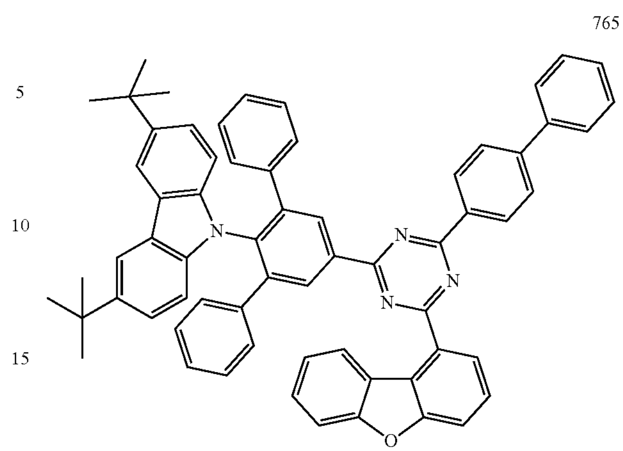
766
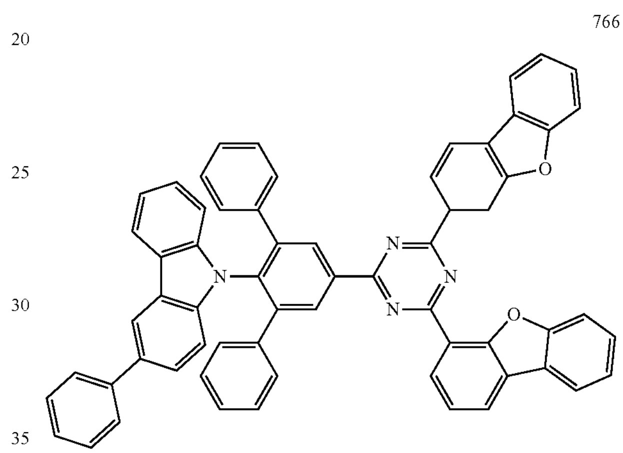
767
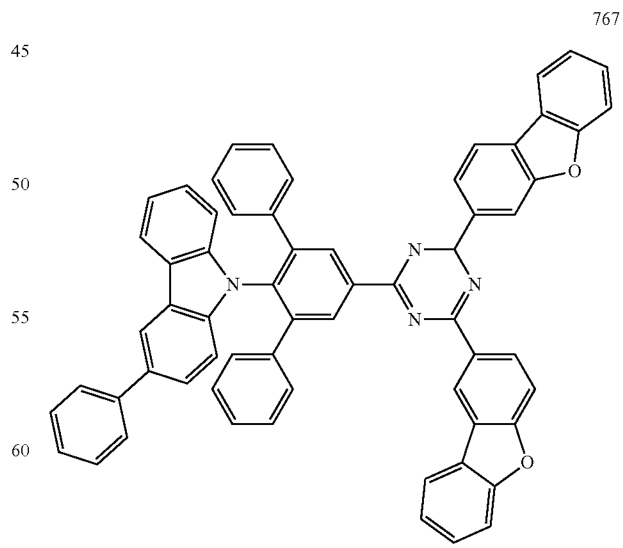

-continued
768
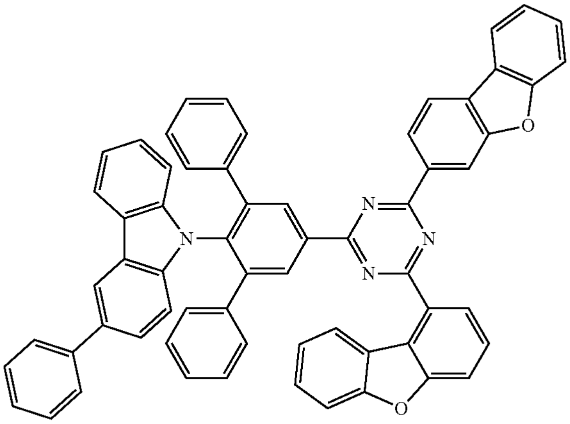
769
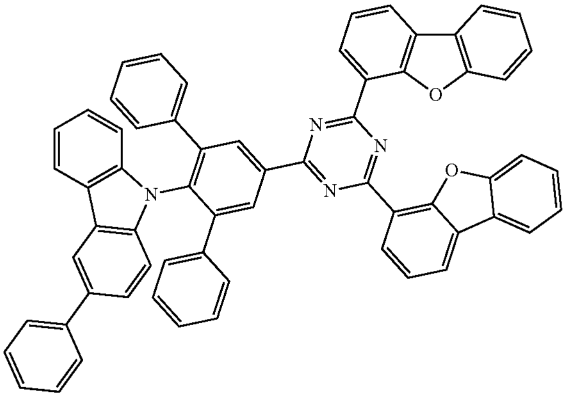
770
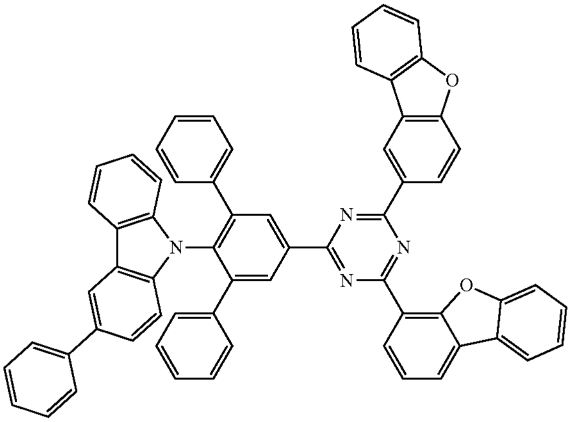
-continued
771
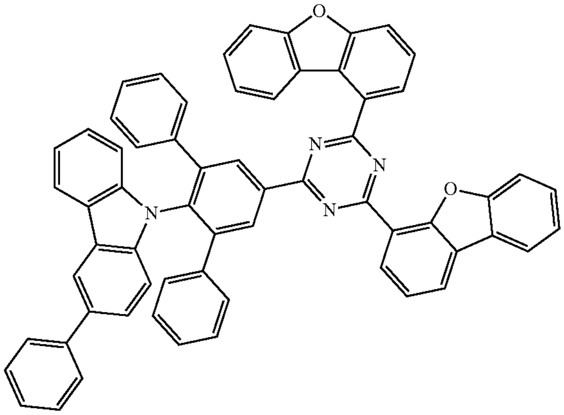
772
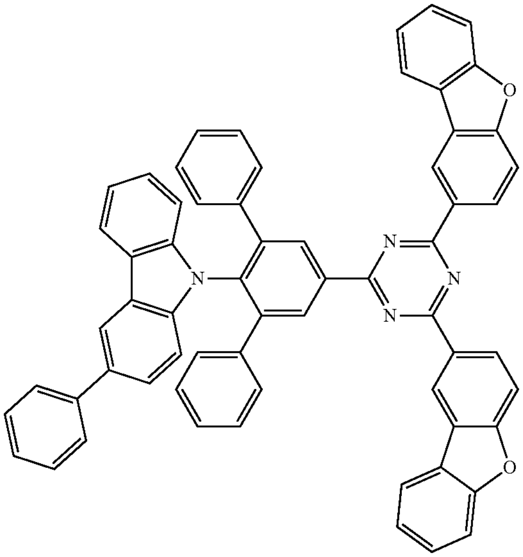
773
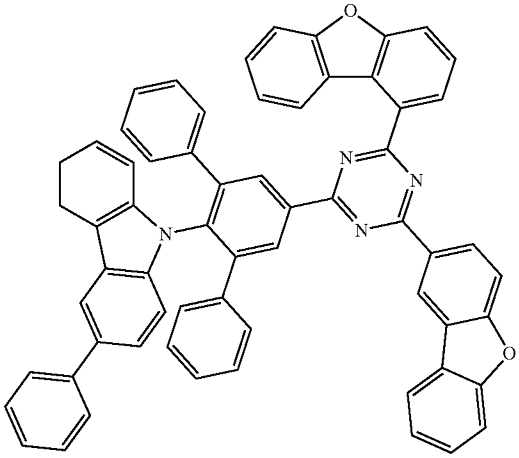

-continued
774
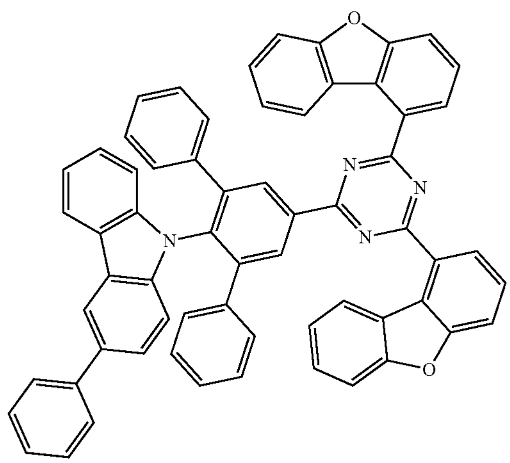
775
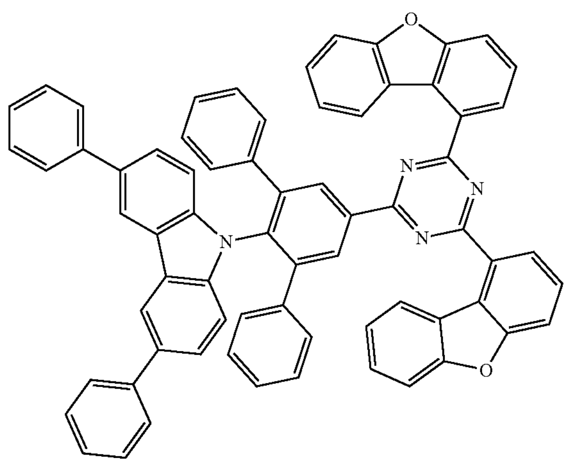
776
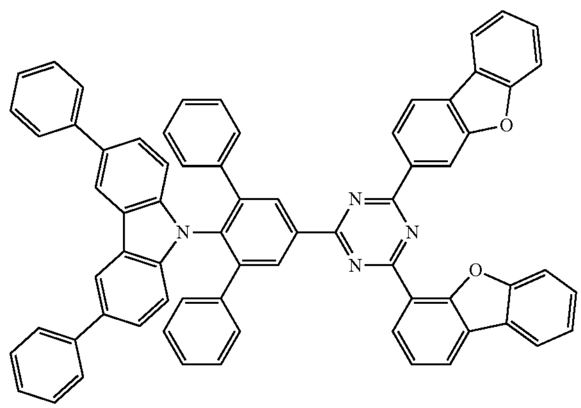
-continued
777
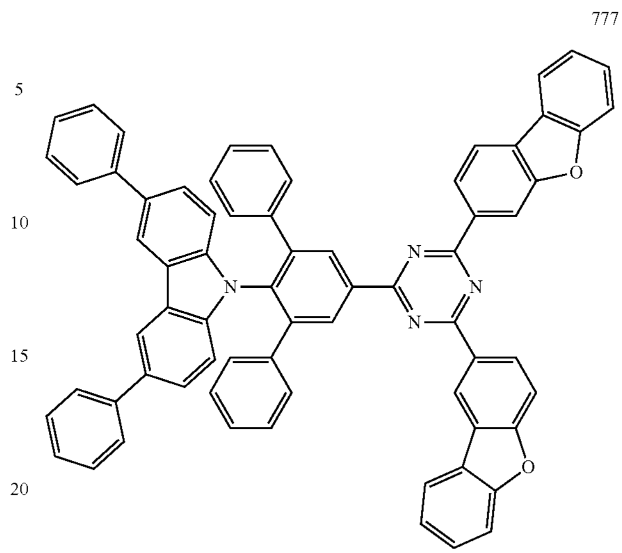
778
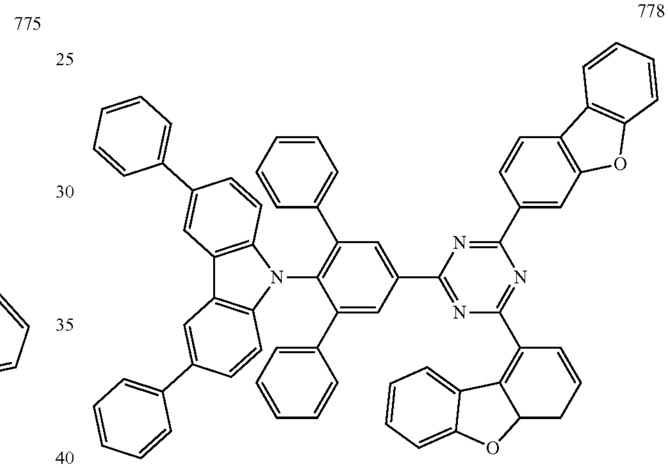
779
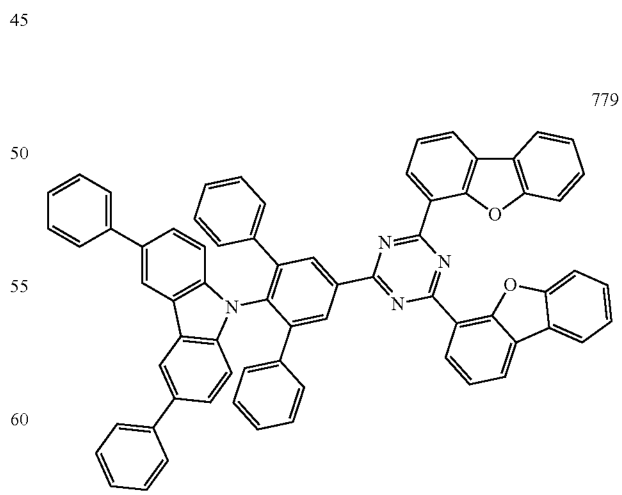

-continued
780
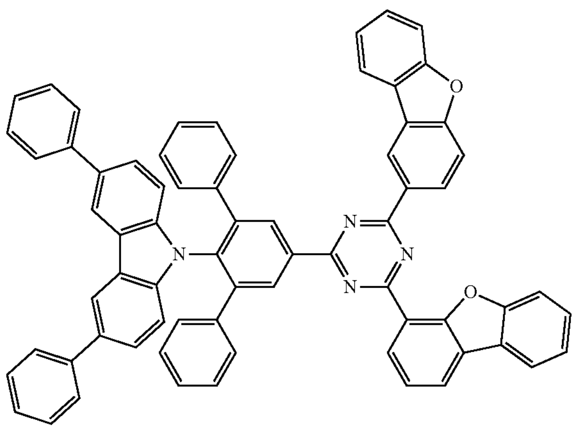
781
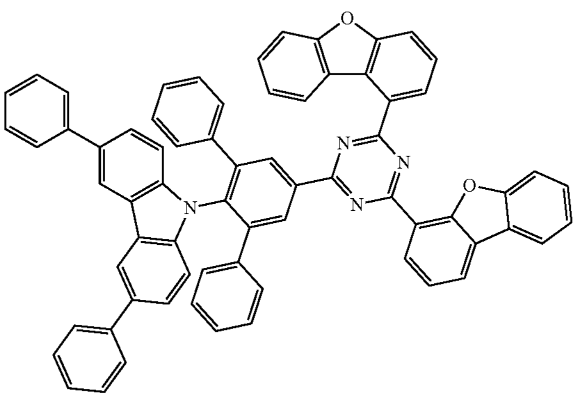
782
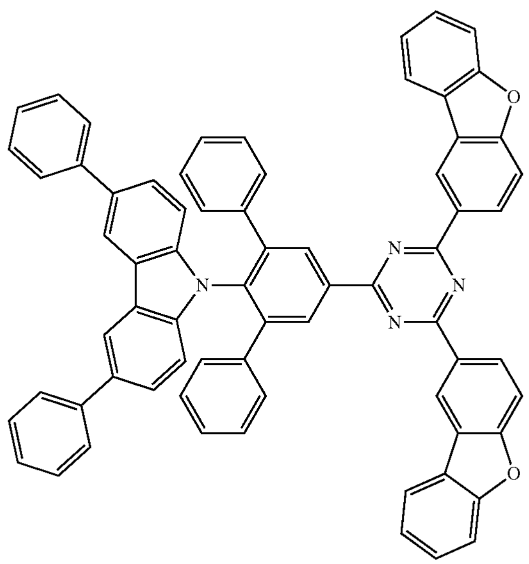
-continued
783
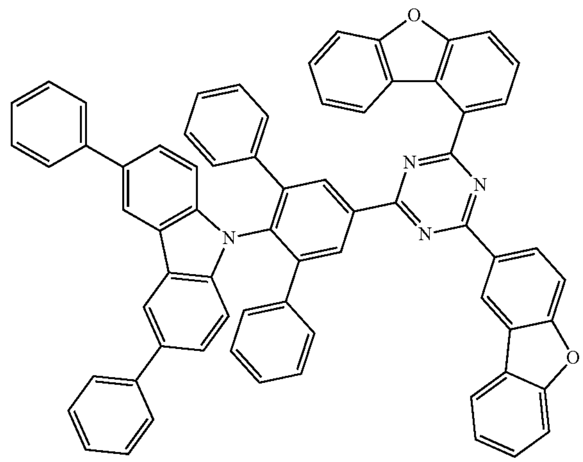
784
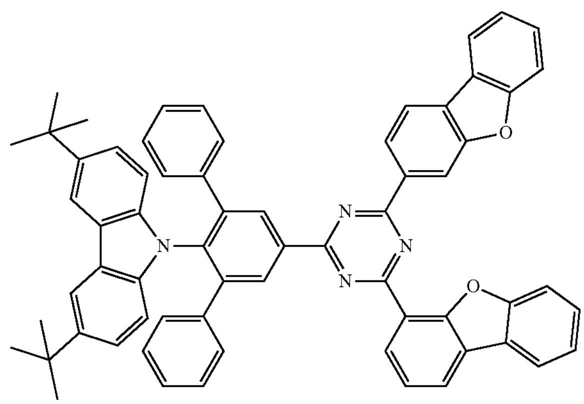
785
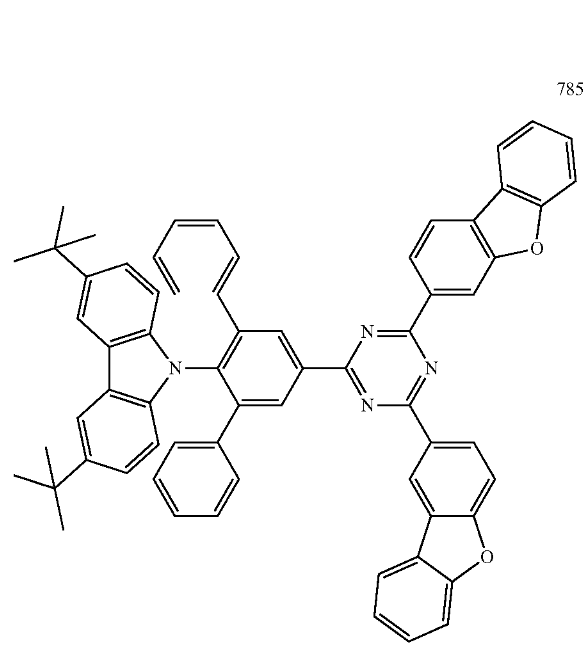

-continued
786
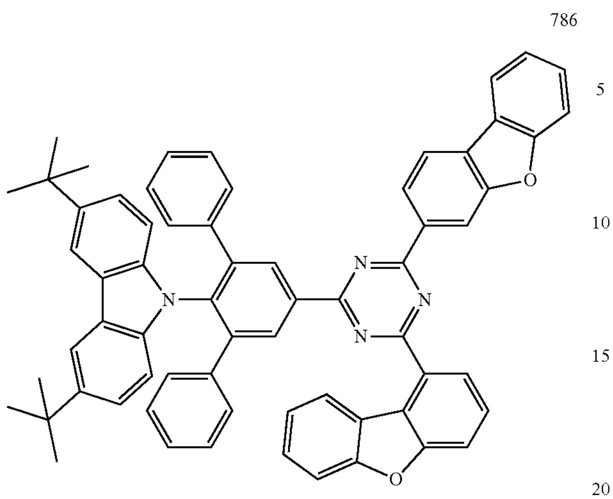
787
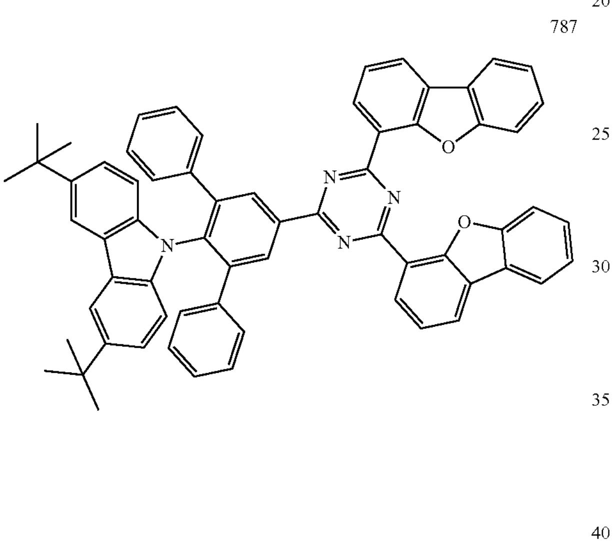
788
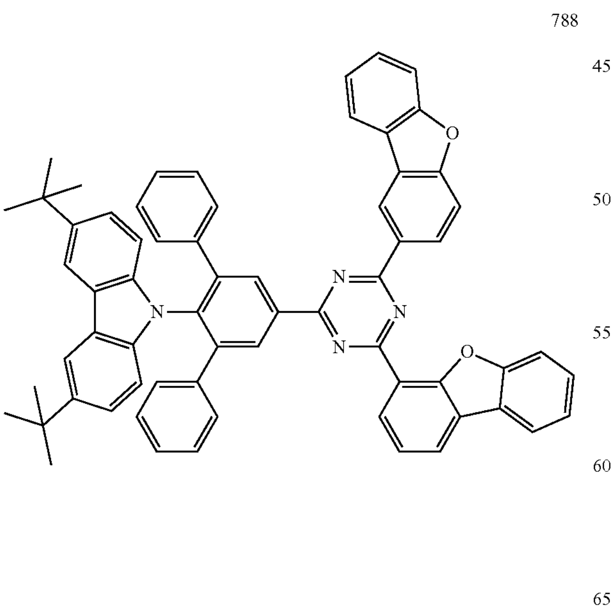
-continued
789
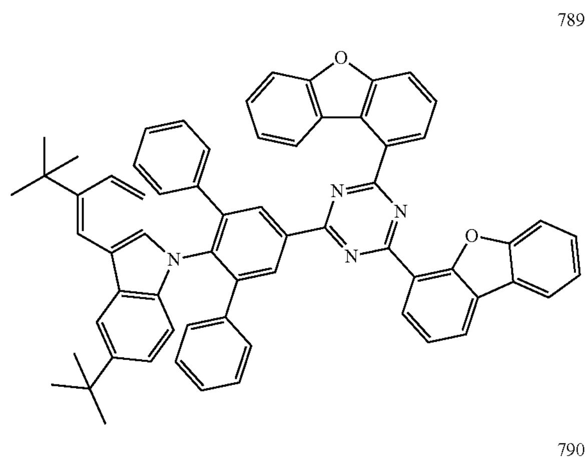
790
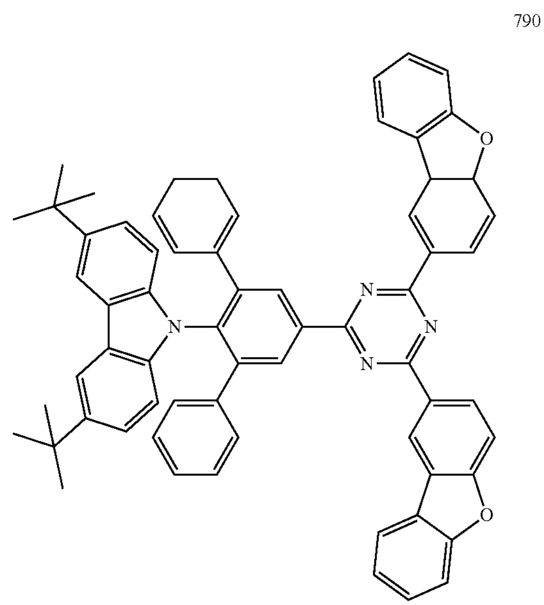
791
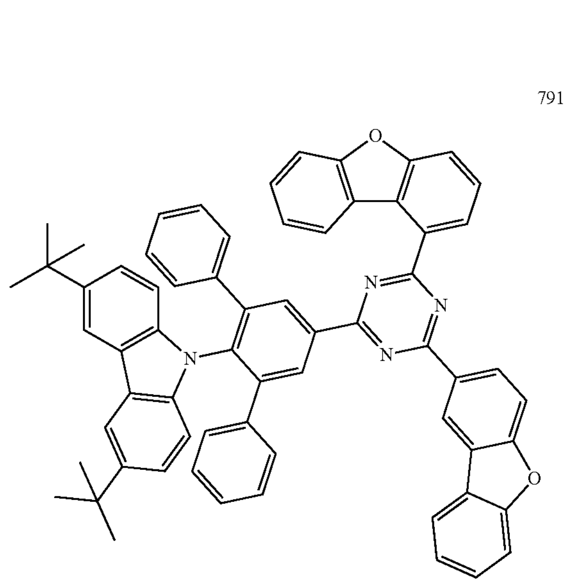

-continued
792
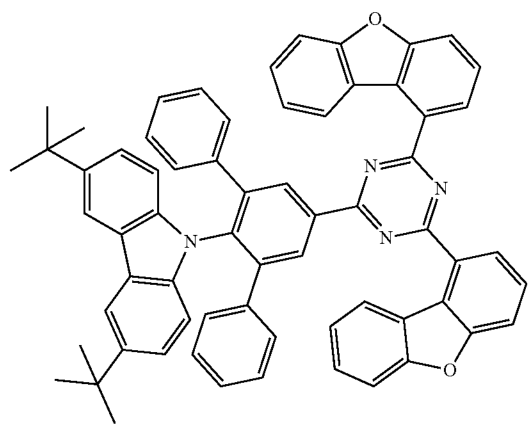
793
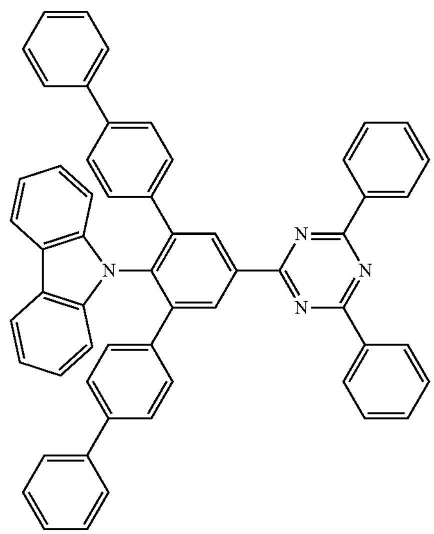
794
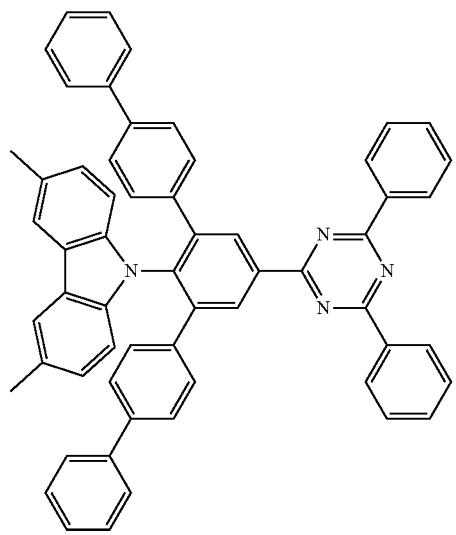
-continued
795
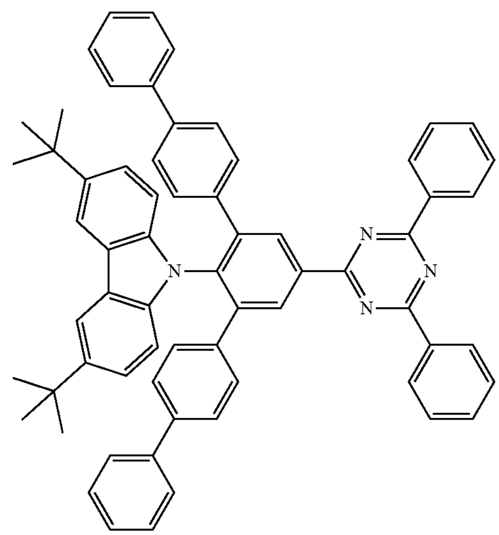
796
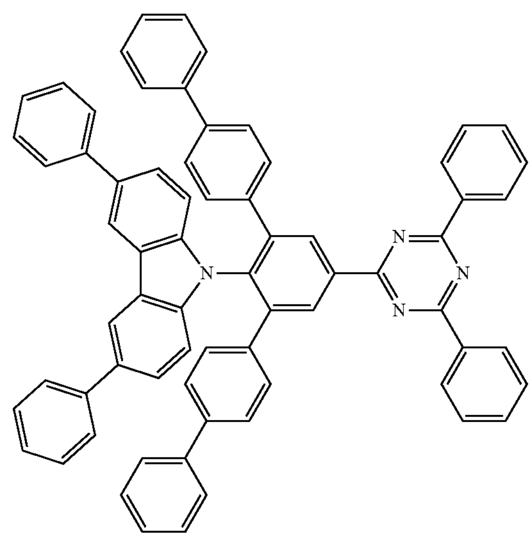
797
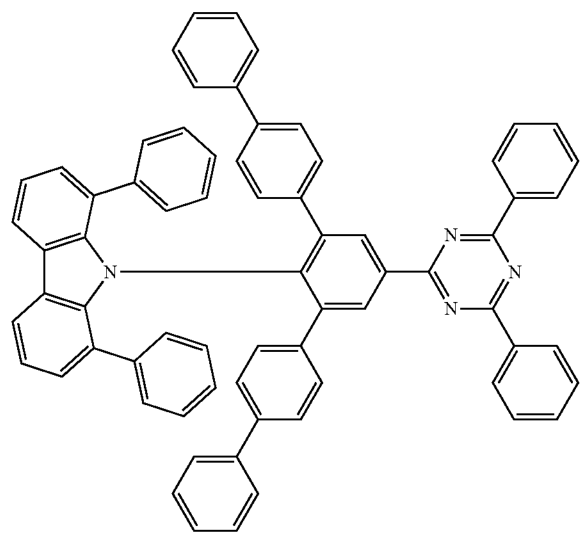

-continued
798
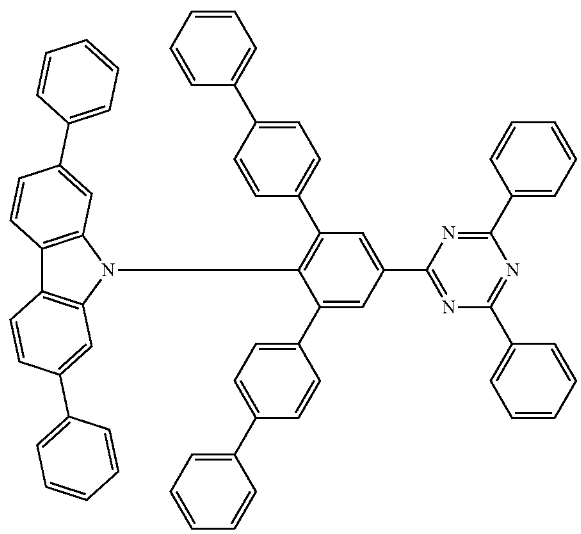
799
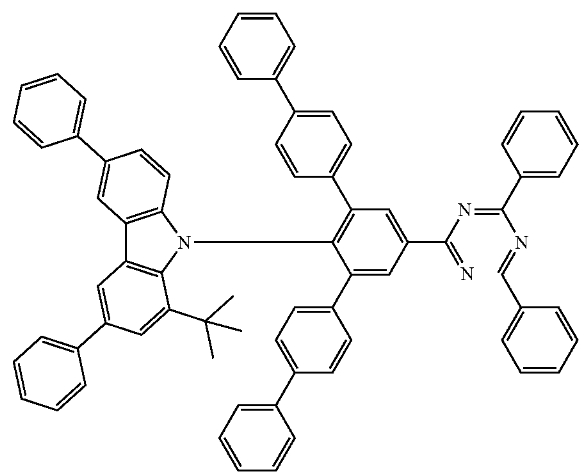
800
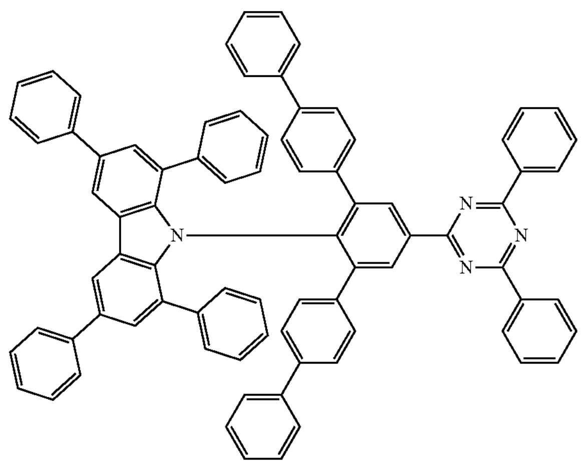
-continued
801
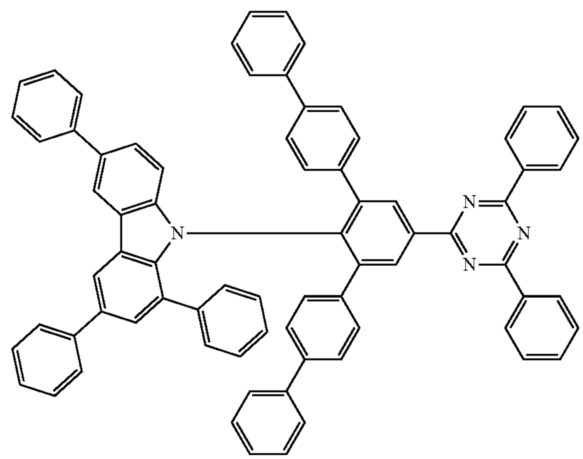
802
803
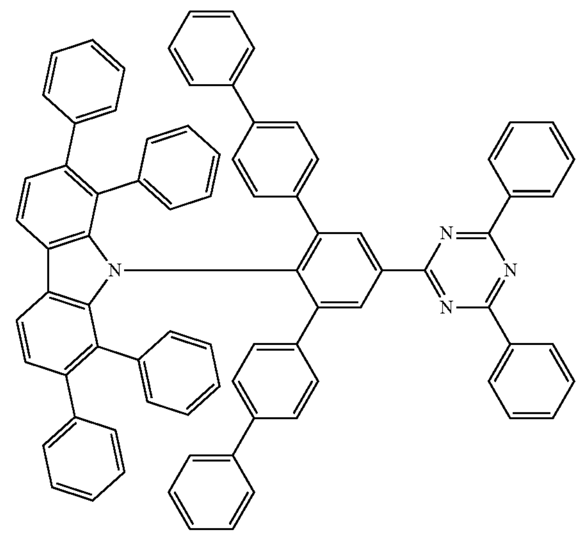

-continued
804
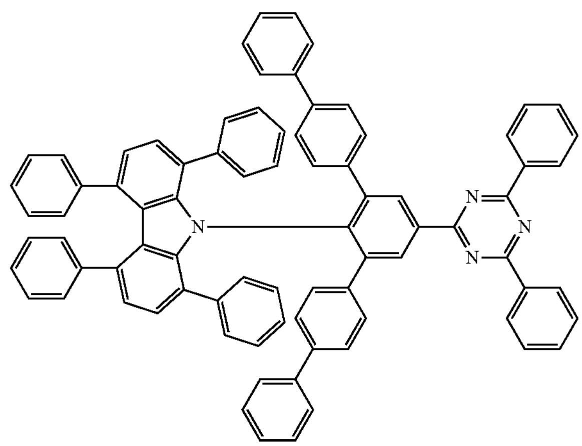
805
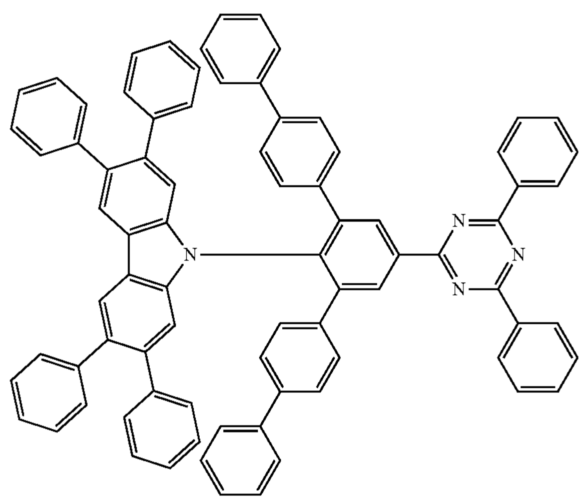
806
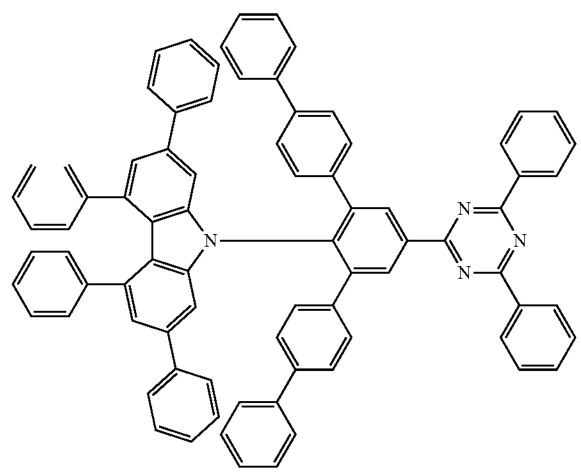
-continued
807
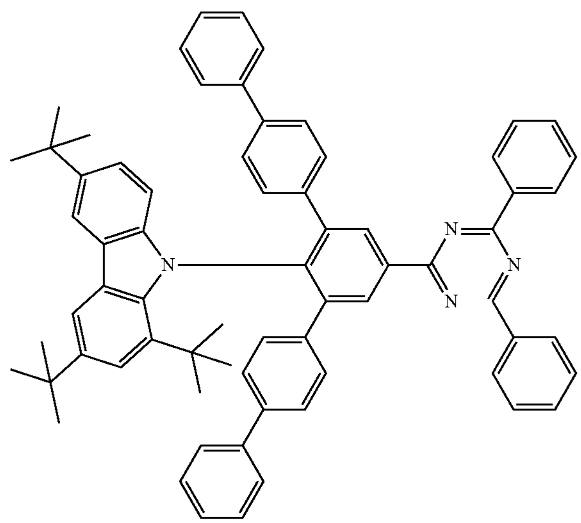
808
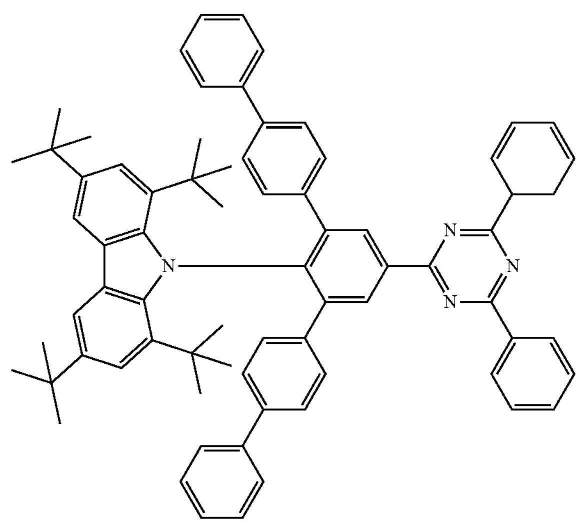
809
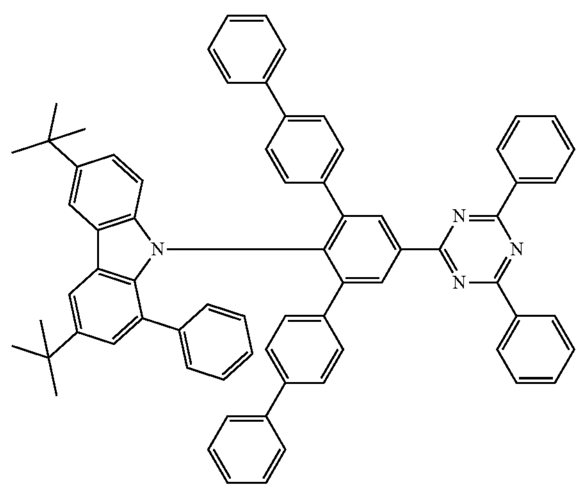

-continued
810
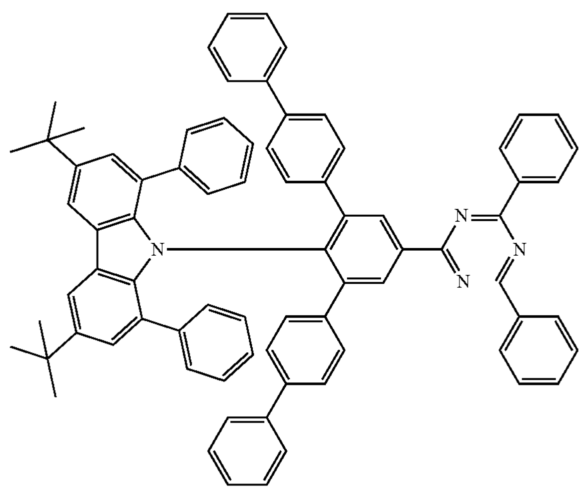
811
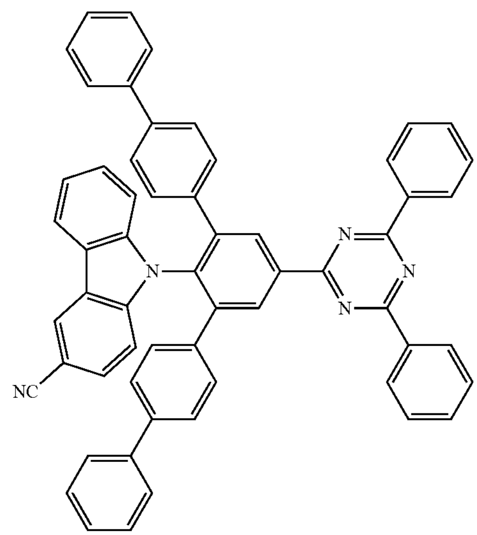
812
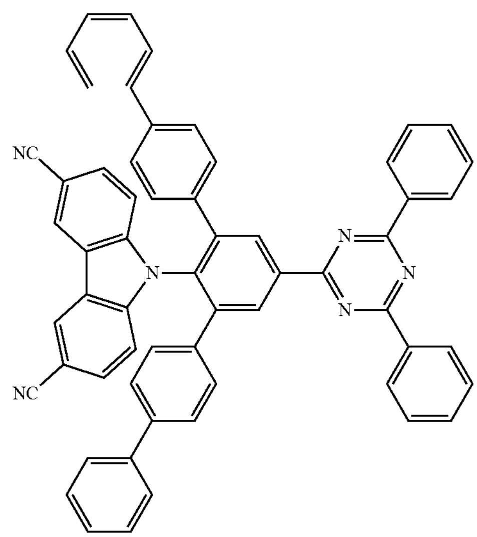
-continued
813
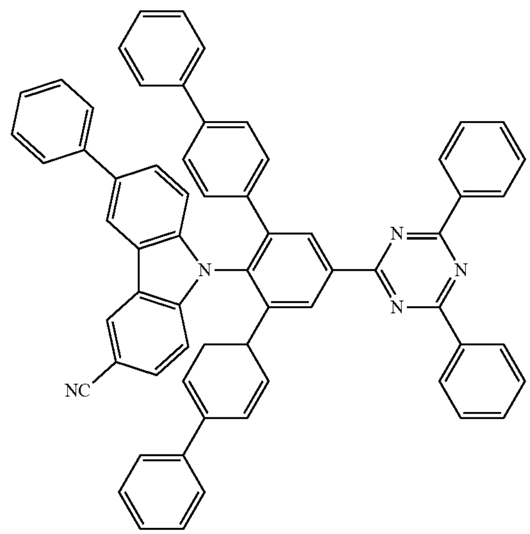
814
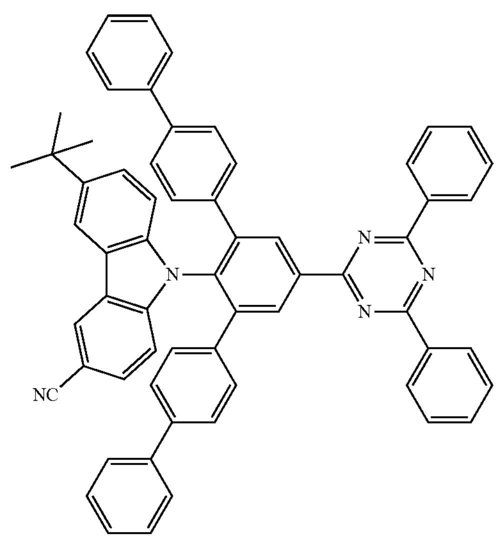
815
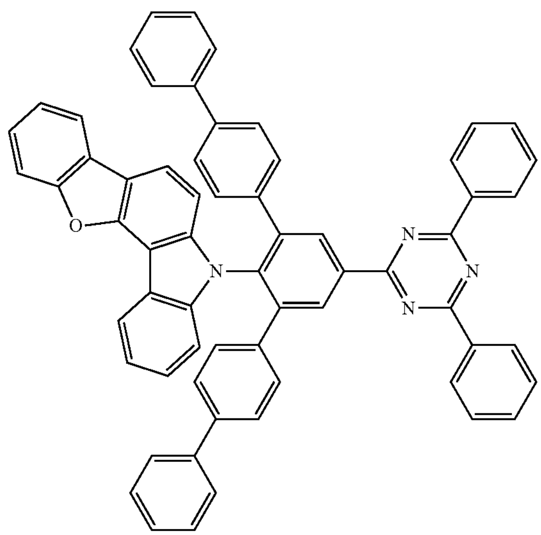

-continued
816
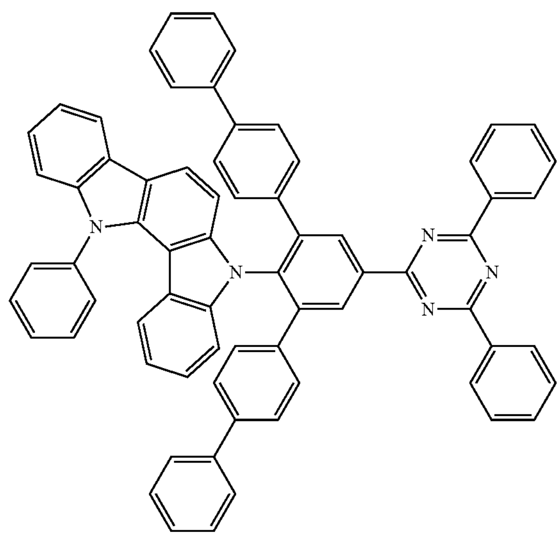
817
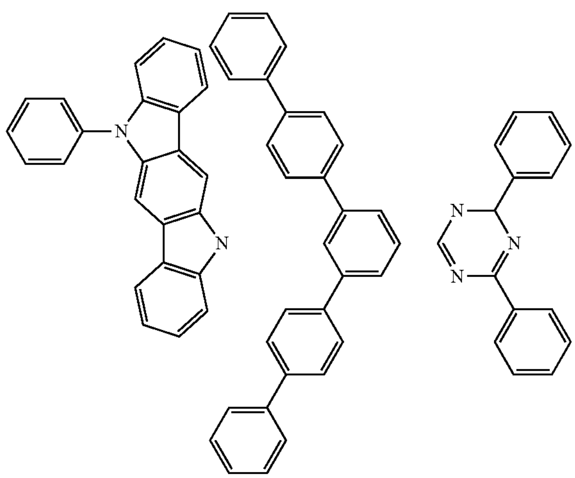
818
-continued
819
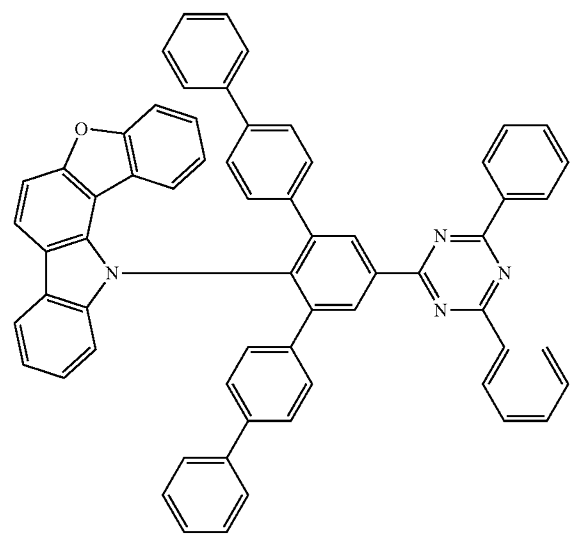
820
821
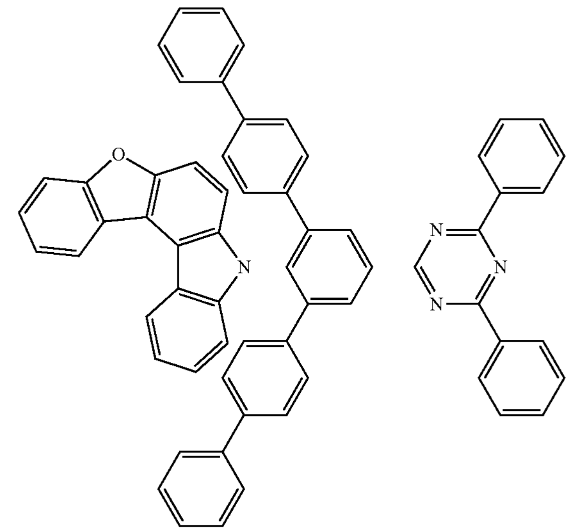

-continued
822
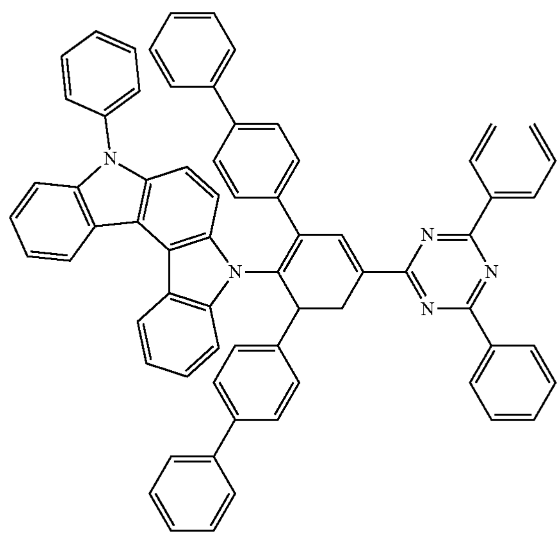
823
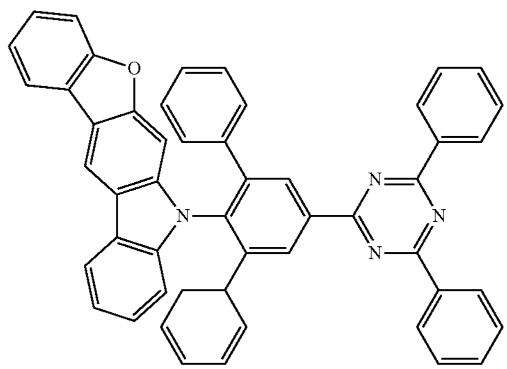
824
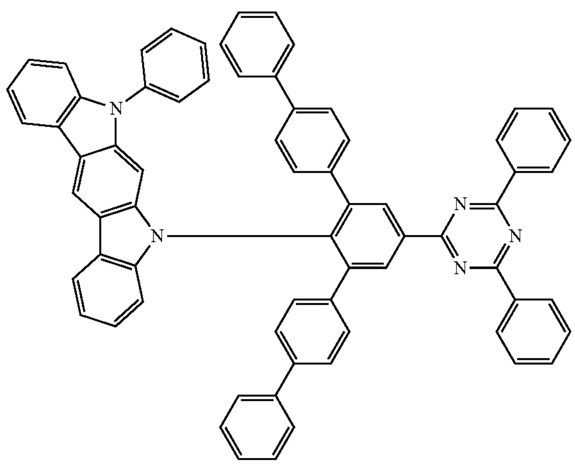
-continued
825
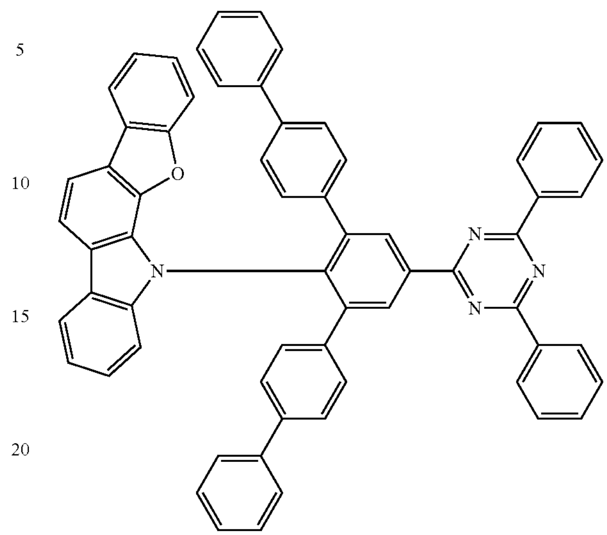
826
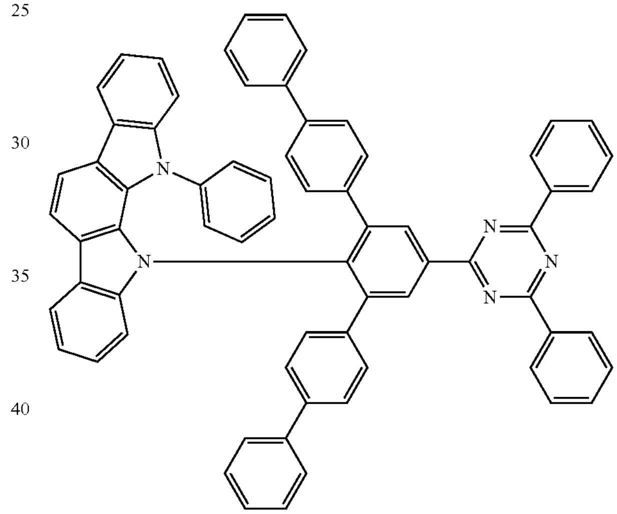
827
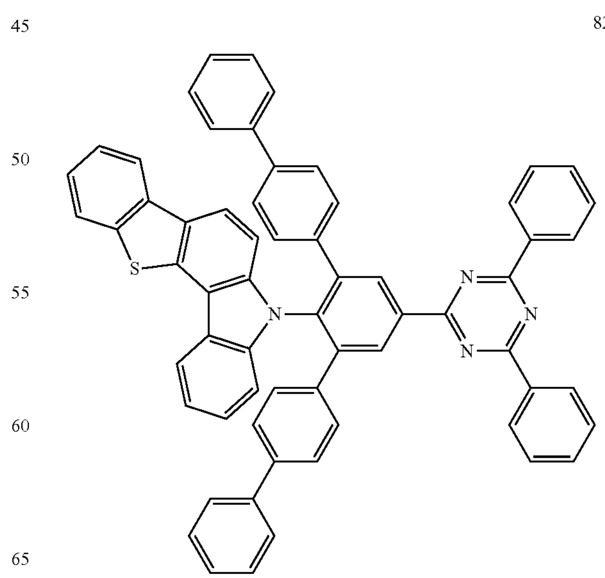

-continued
828
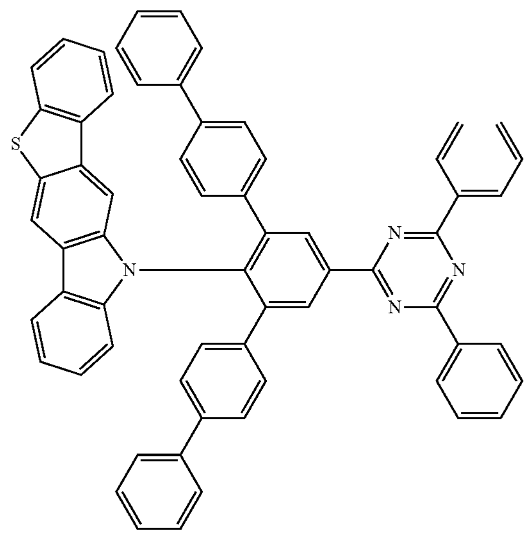
829
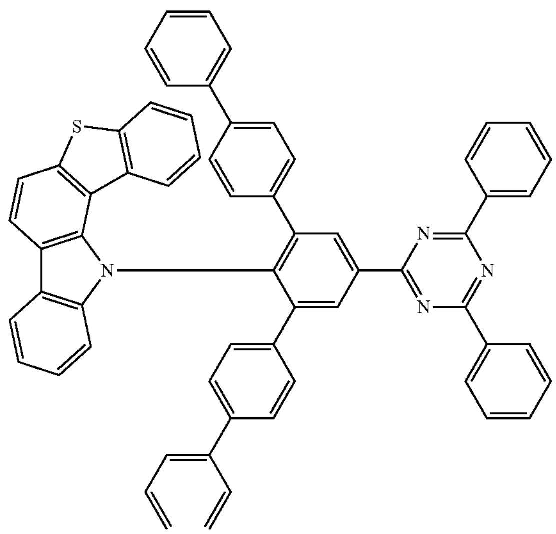
830
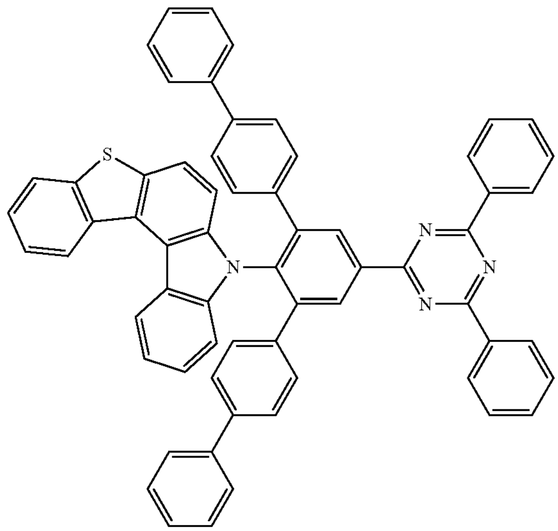
-continued
831
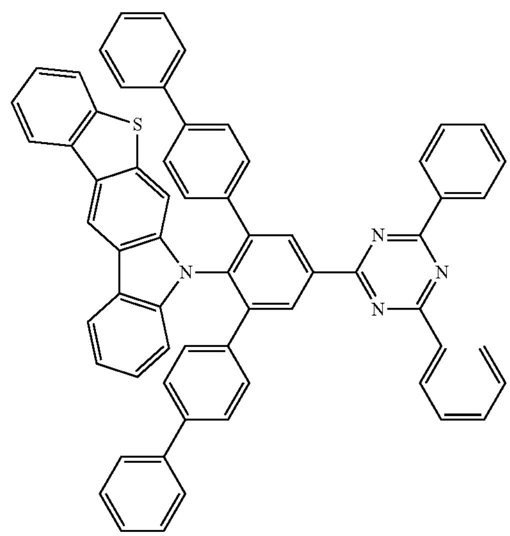
832
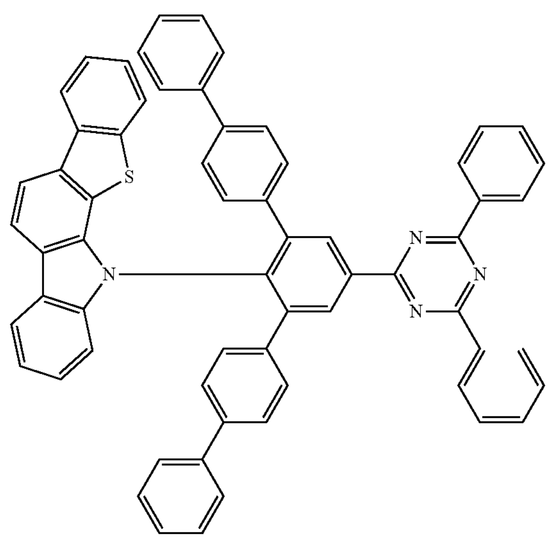
833
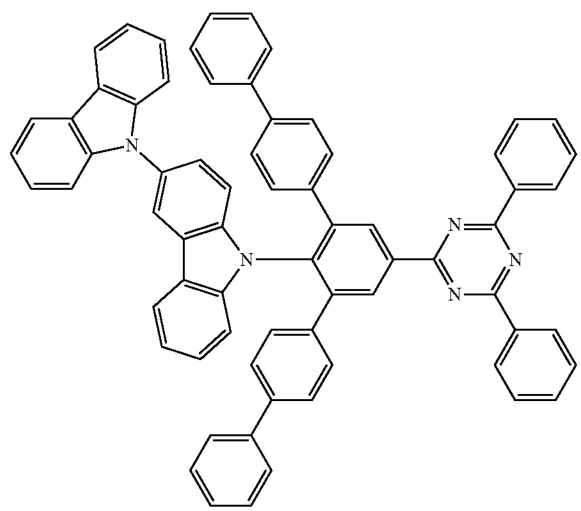

-continued
834
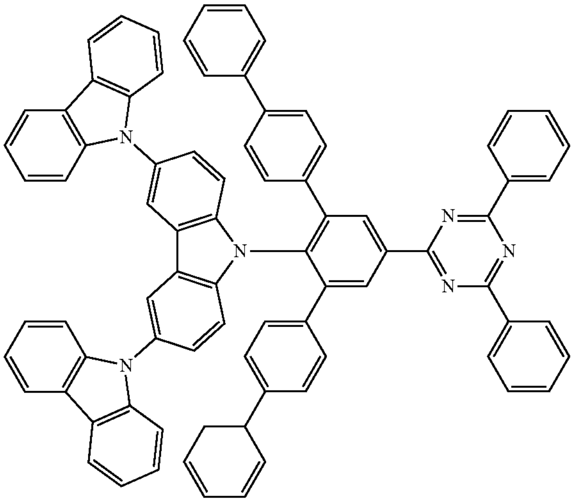
835
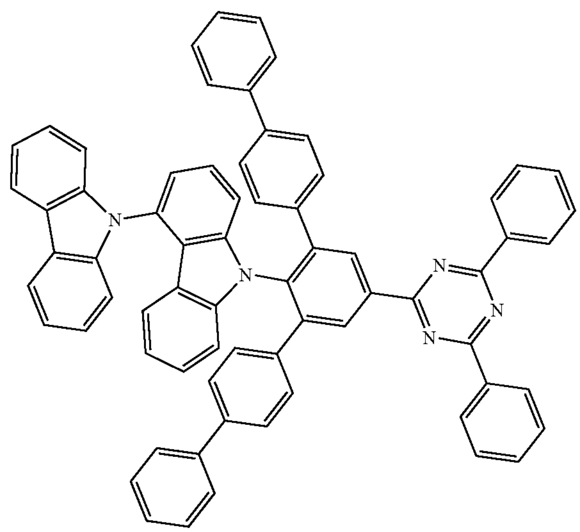
836
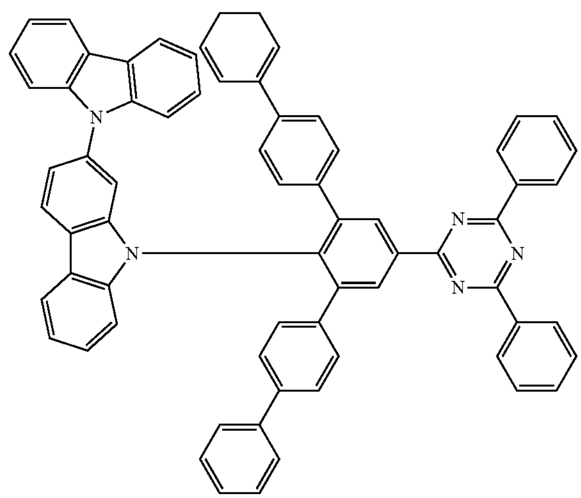
-continued
837
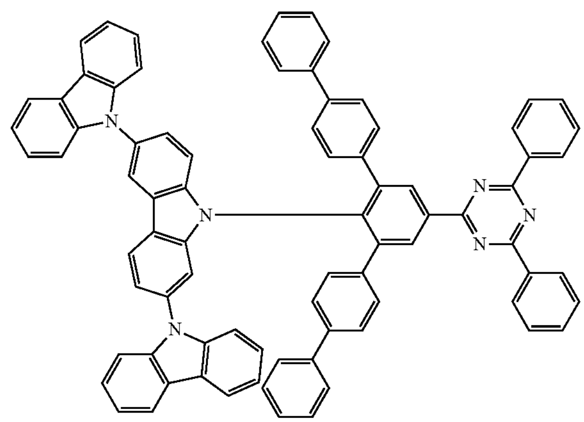
838
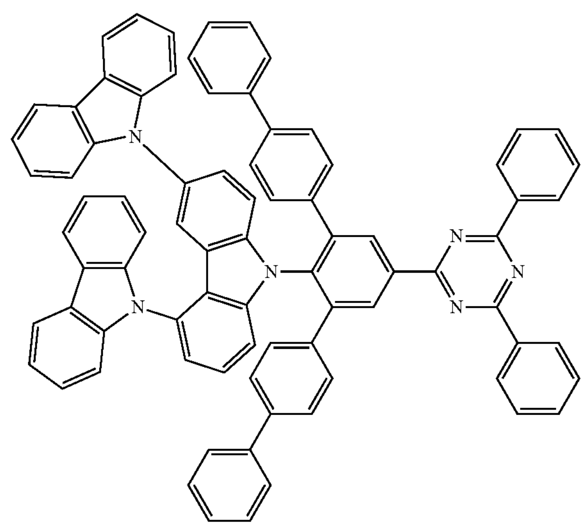
839
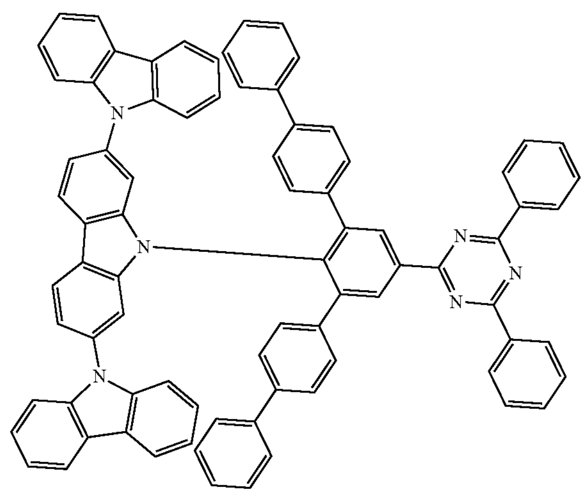

-continued
840
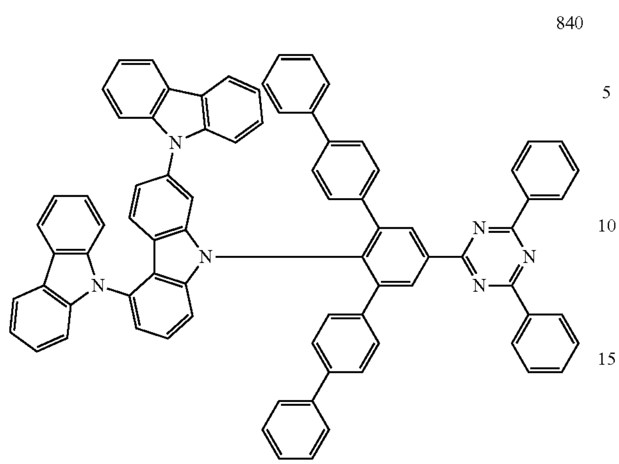
841
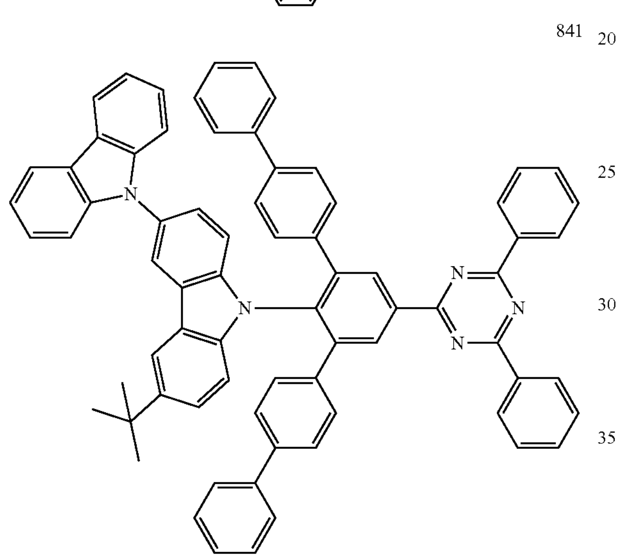
842
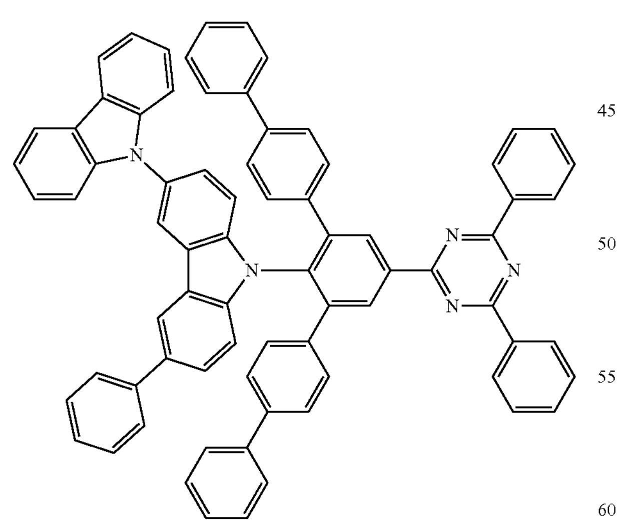
-continued
843
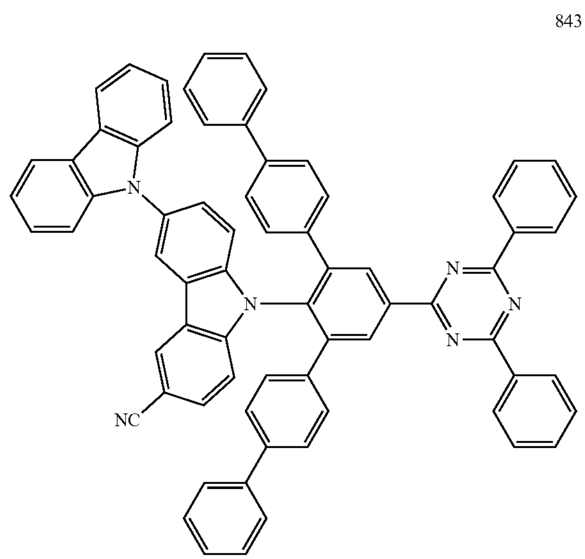
844
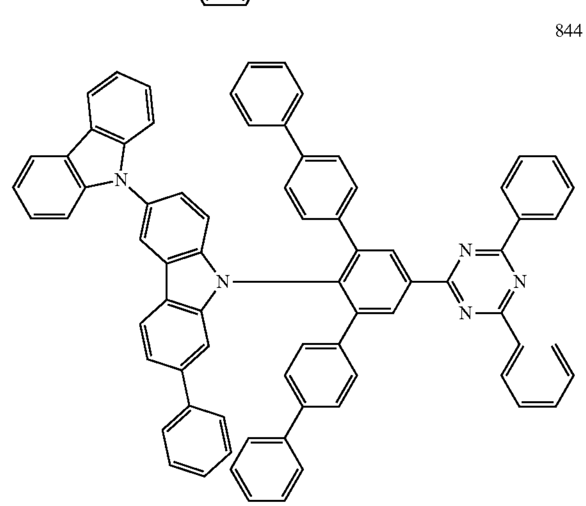
845
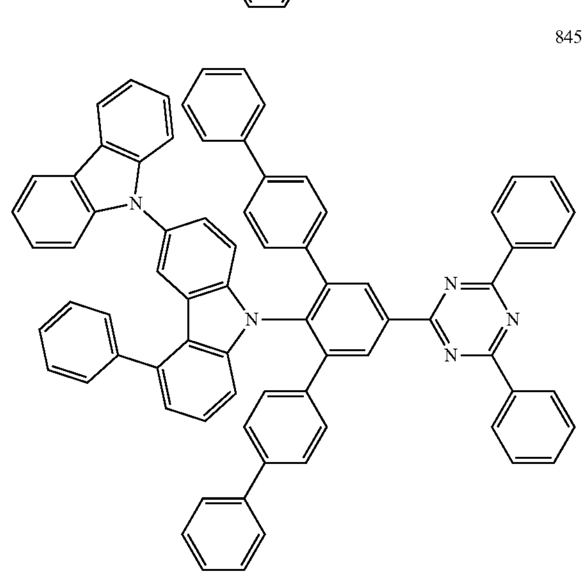

846
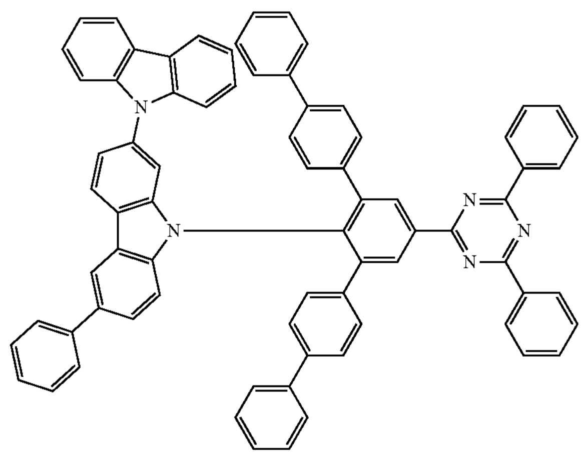
847
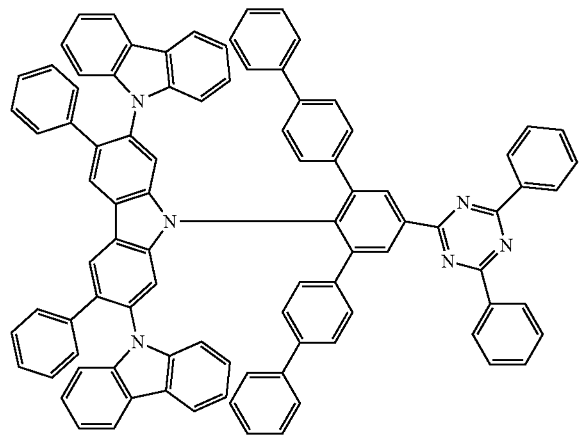
848
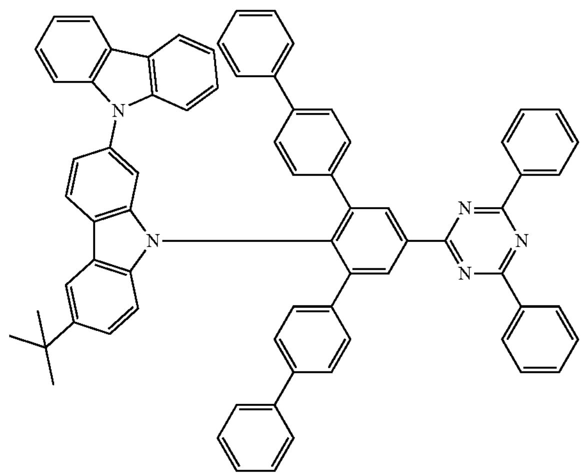
849
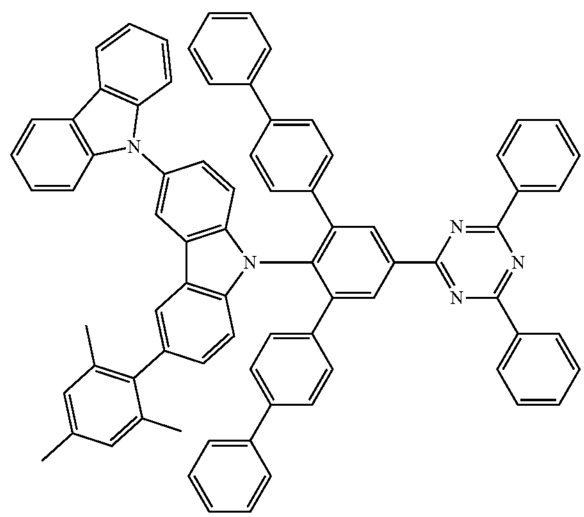
850
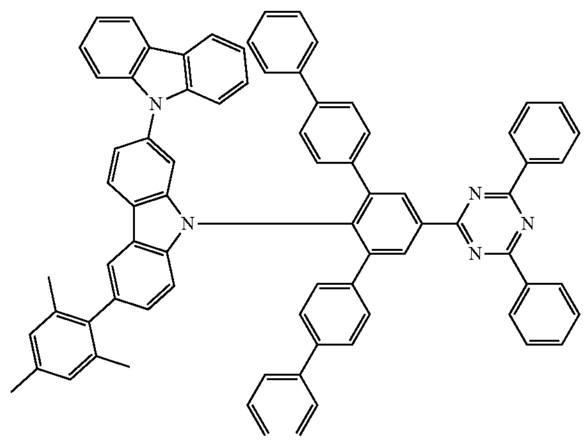
851
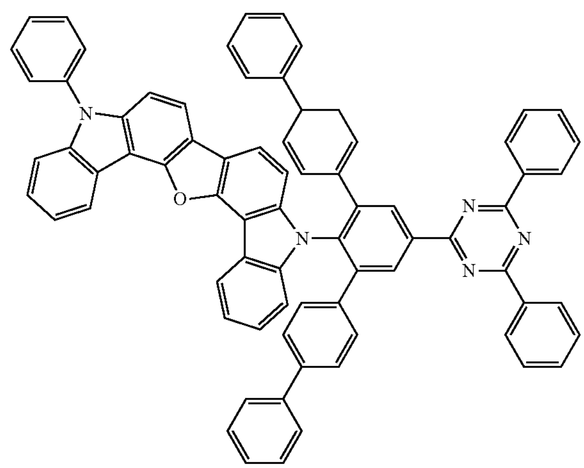

-continued
852
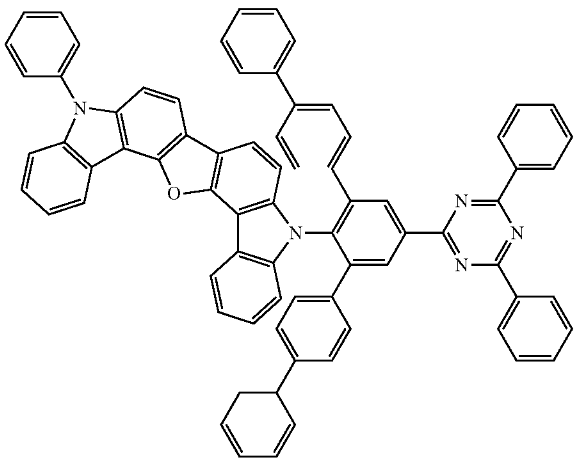
853
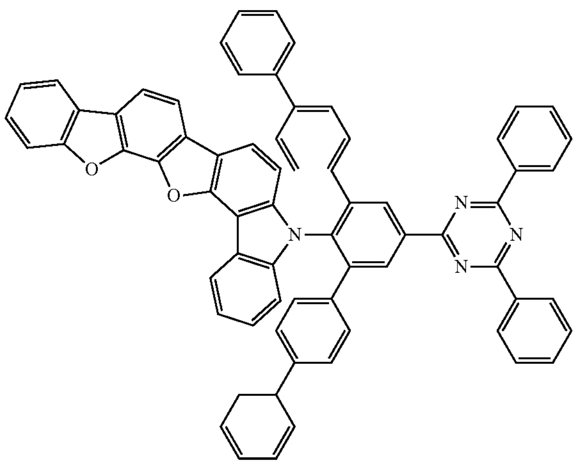
854
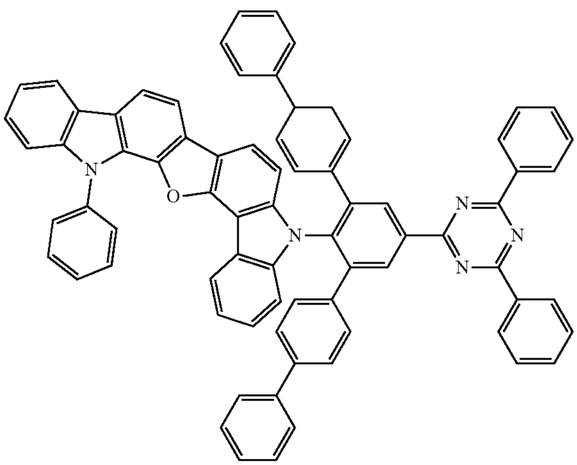
-continued
855
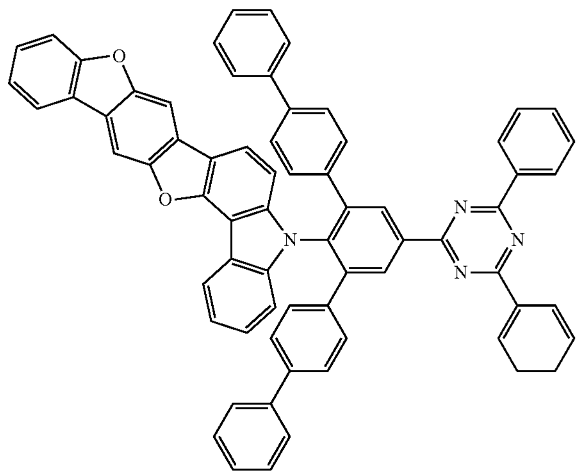
856
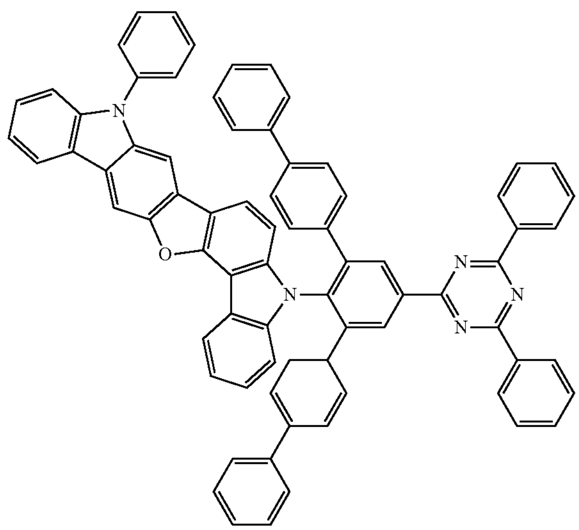
857
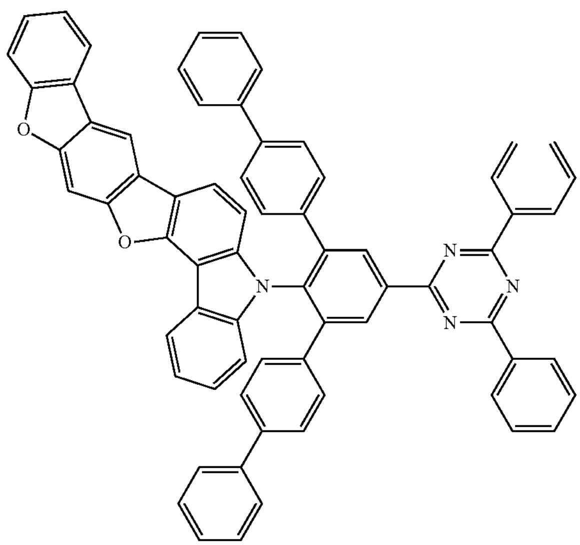

-continued
858
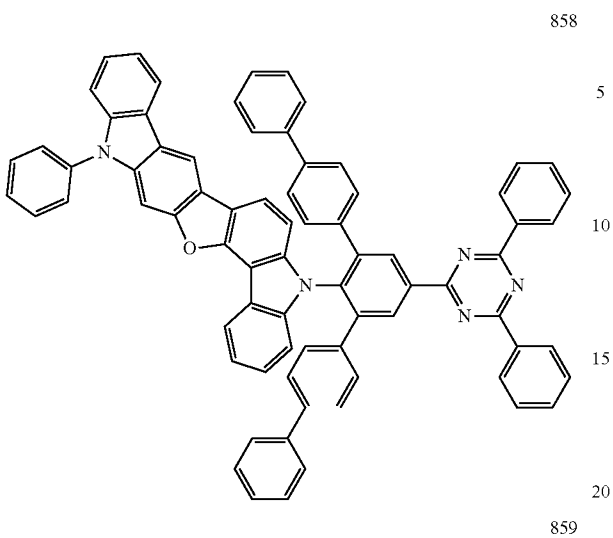
859
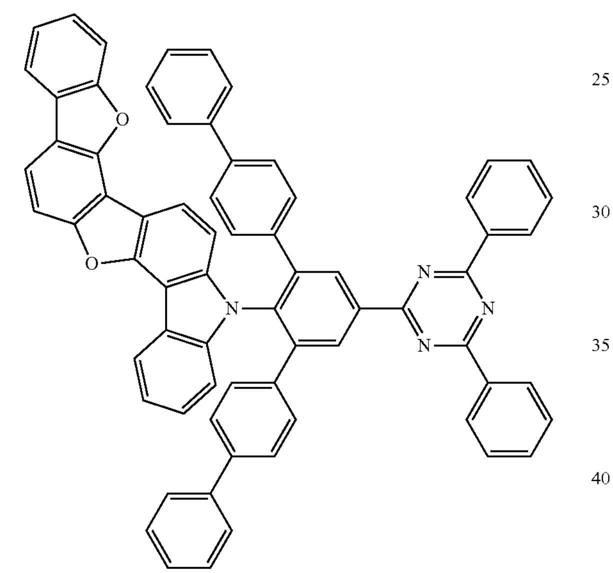
860
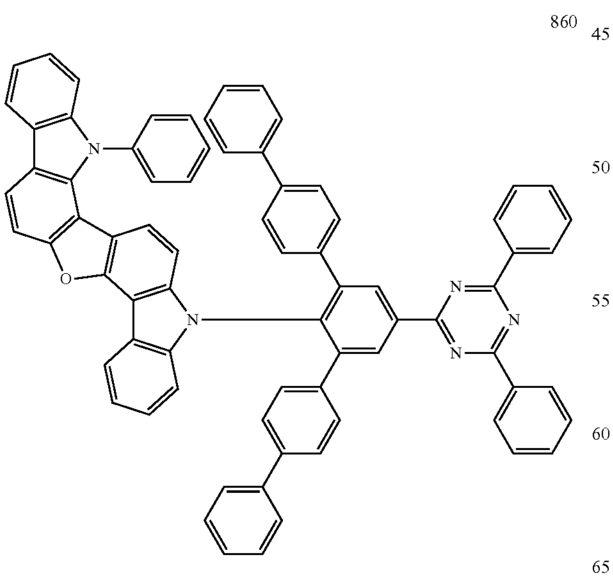
-continued
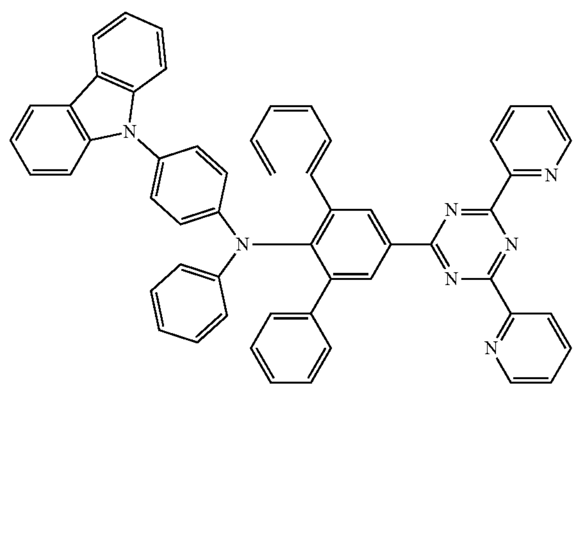
862
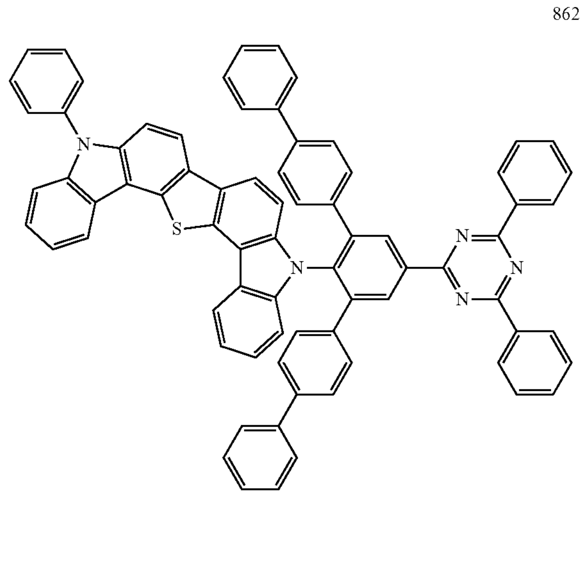
863
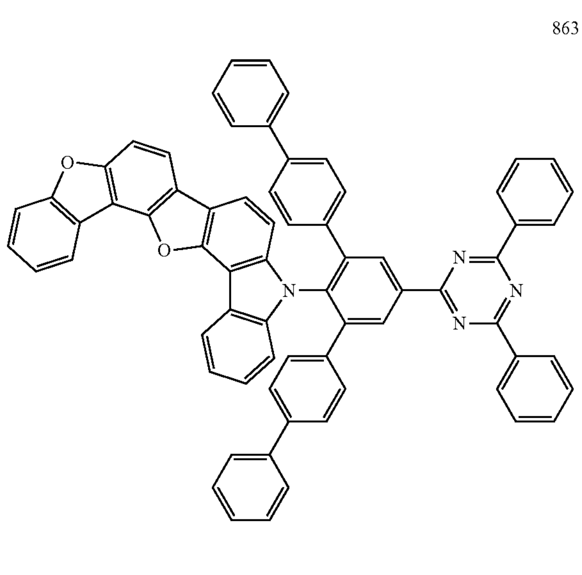

-continued
864
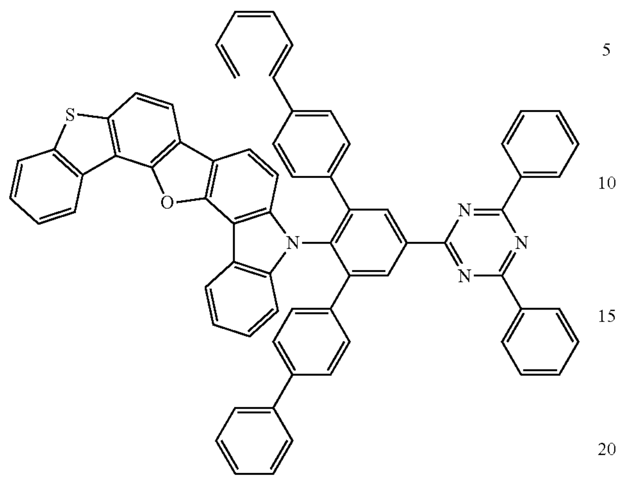
865
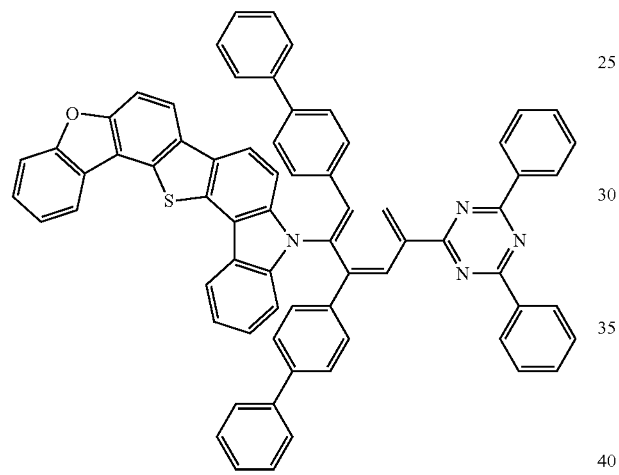
866
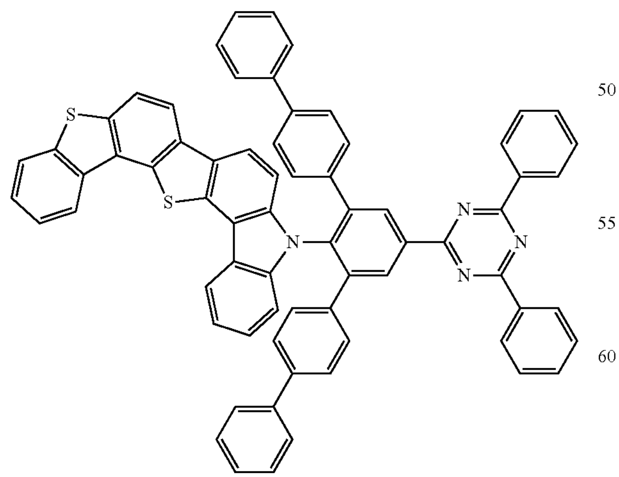
-continued
867
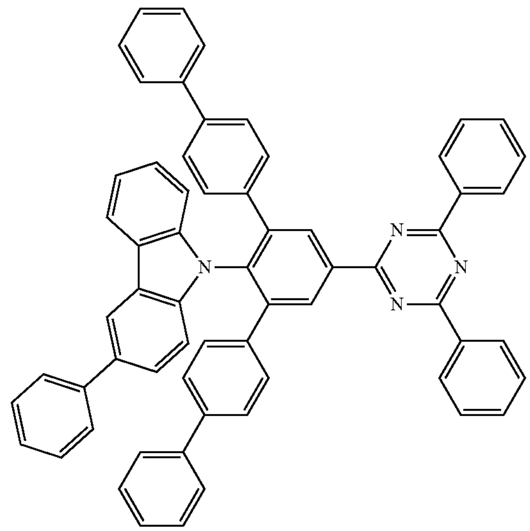
868
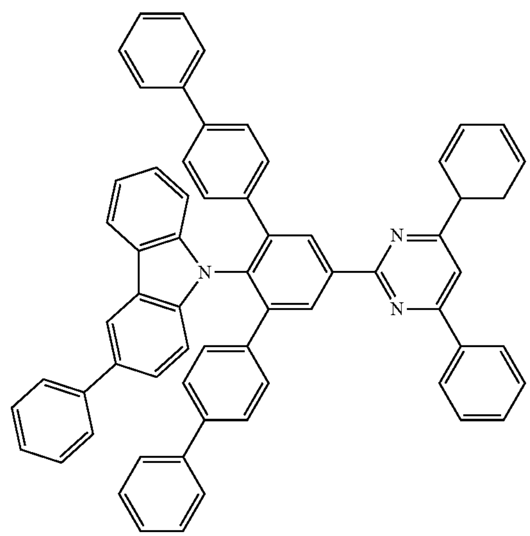
869
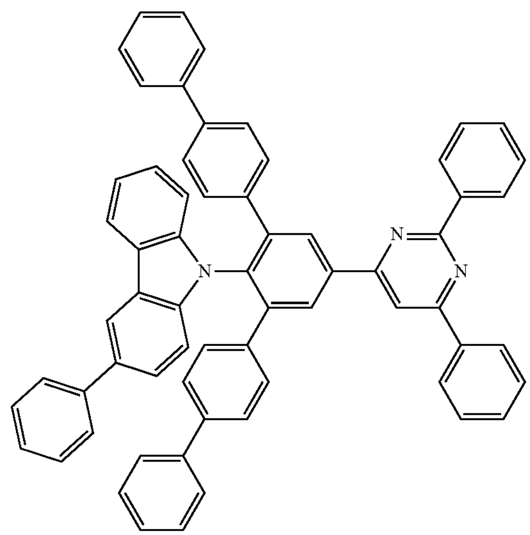

-continued
870
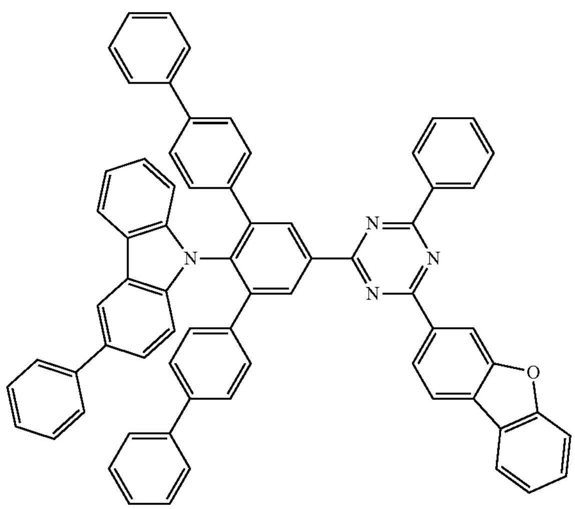
849
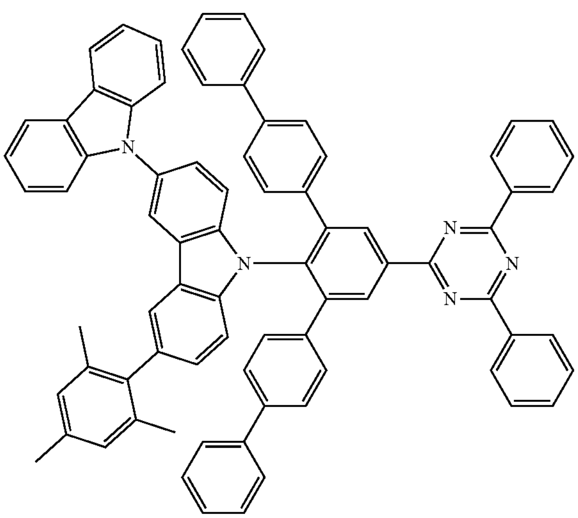
850
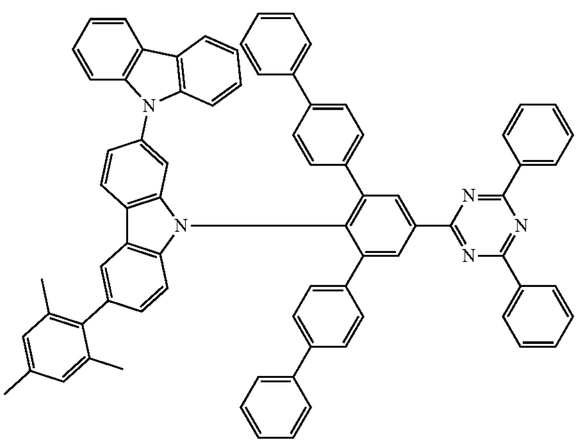
-continued
851
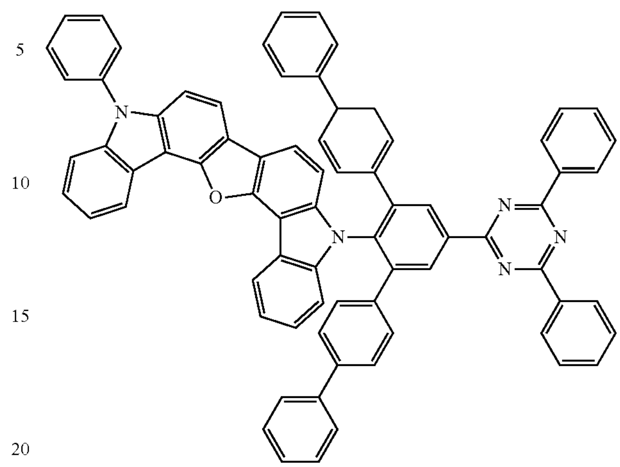
852
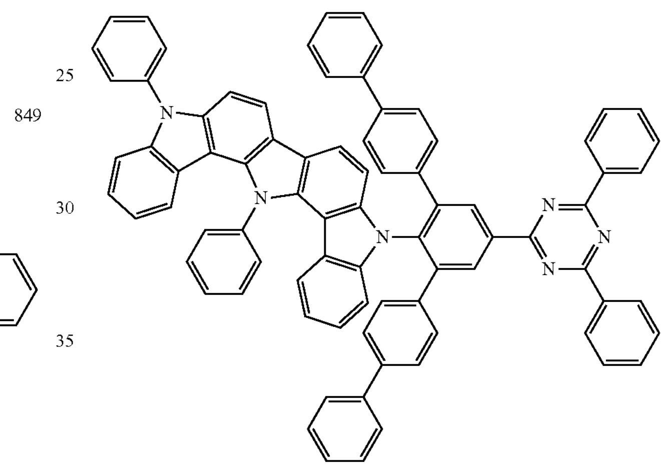
853
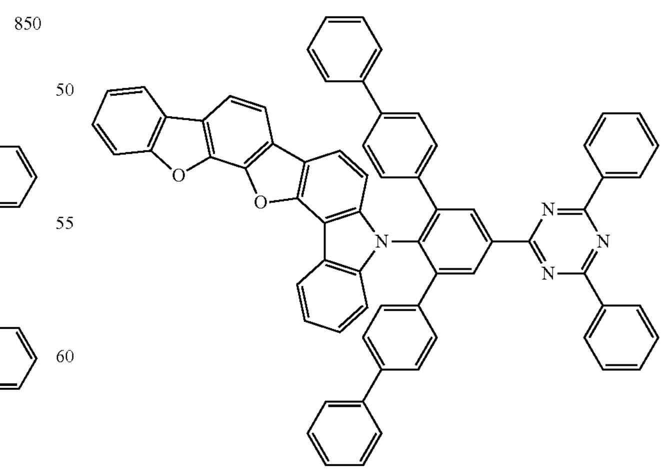

-continued
854
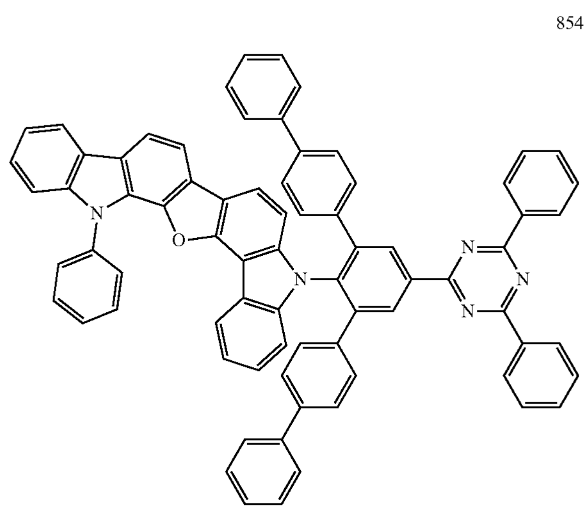
855
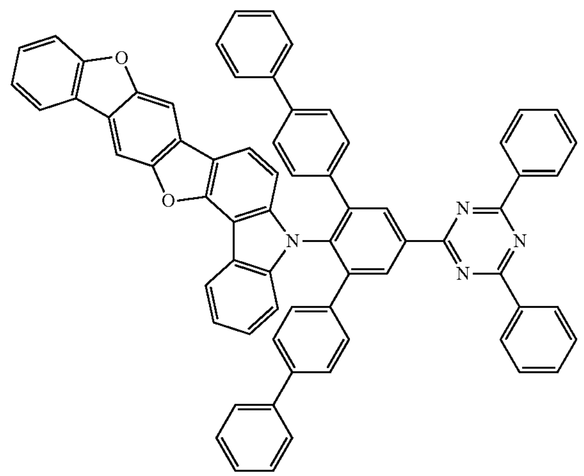
856
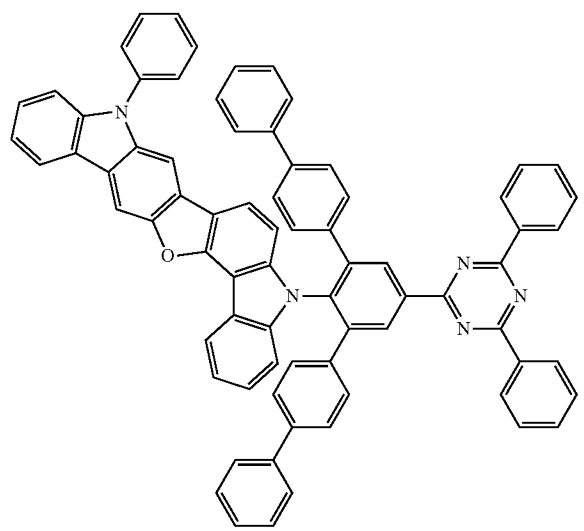
-continued
857
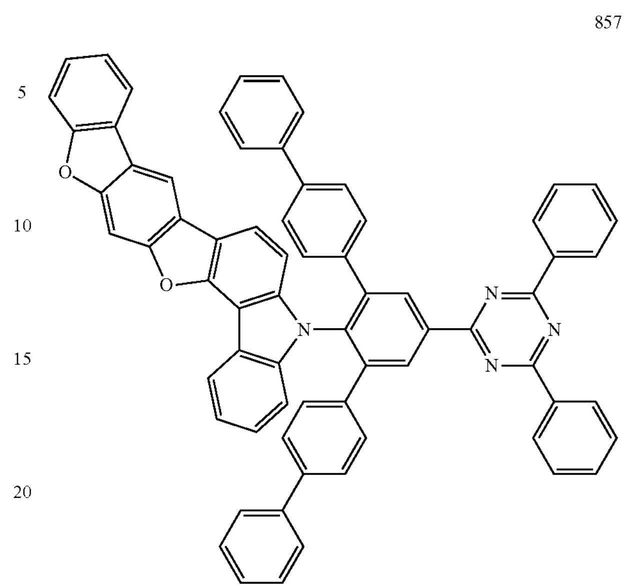
858
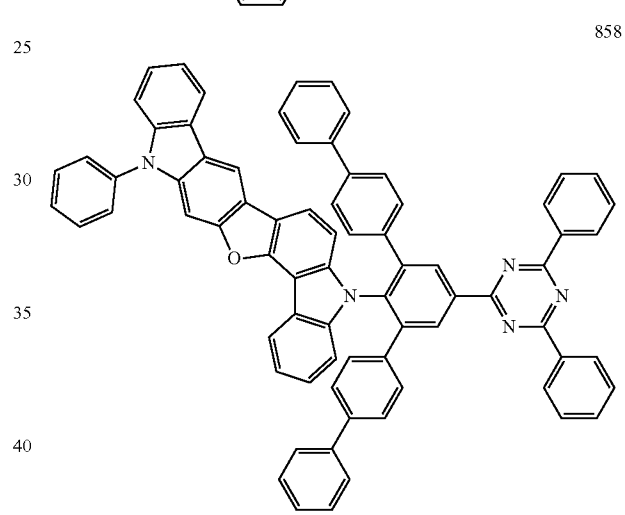
859
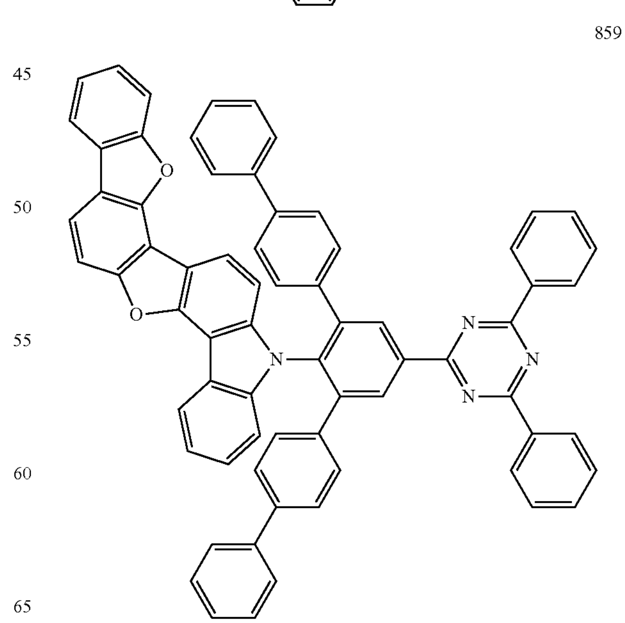

-continued
860
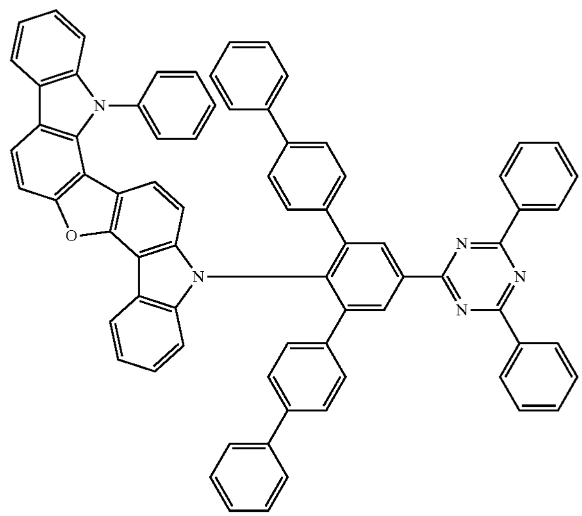
861
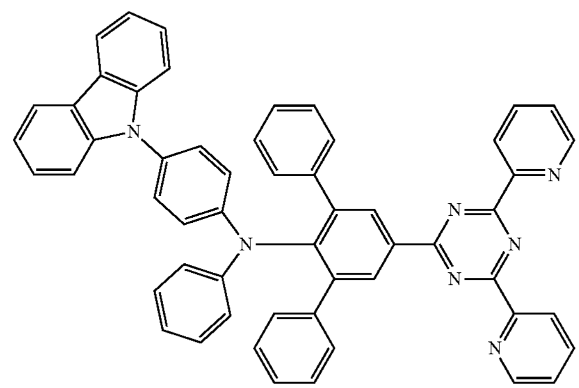
862
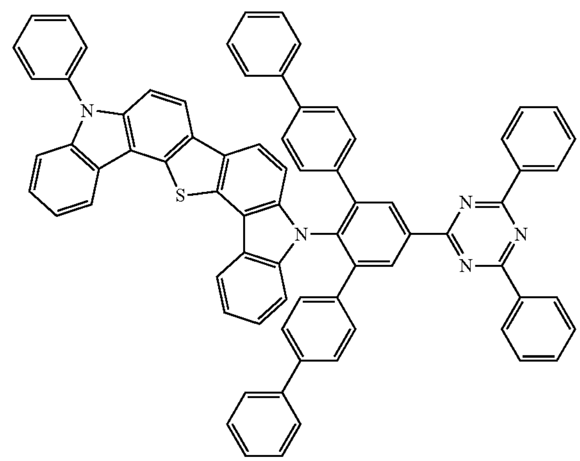
-continued
863
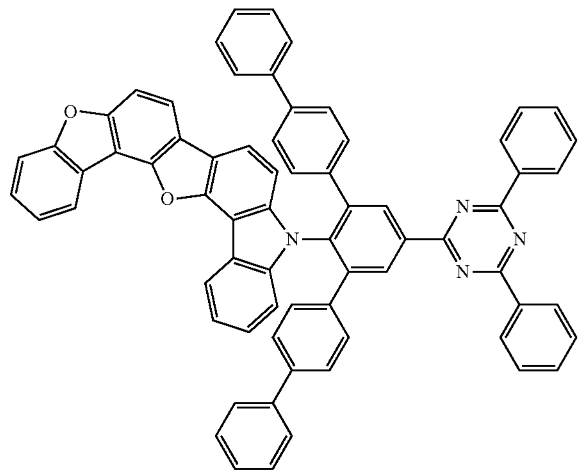
864
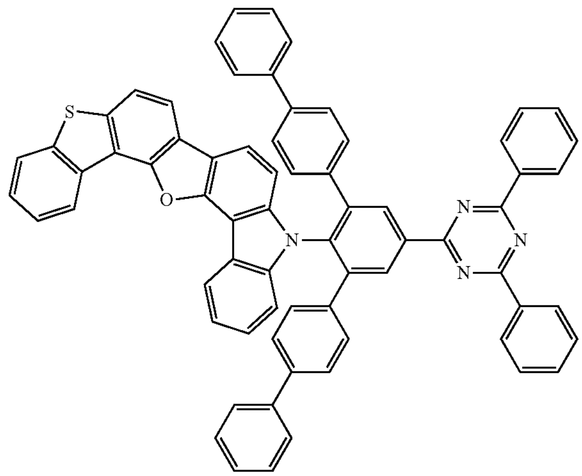
865
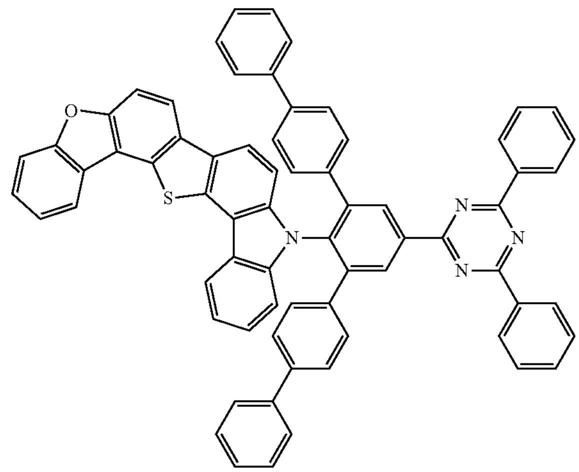

-continued
866
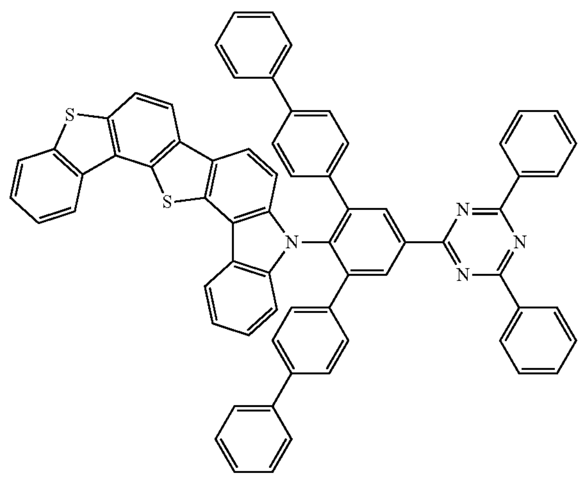
867
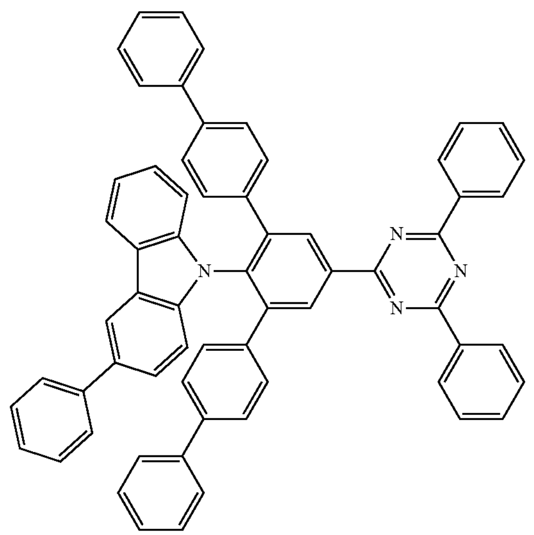
868
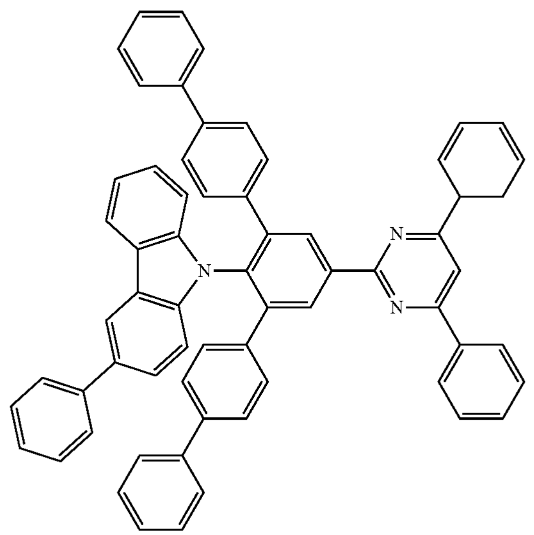
-continued
869
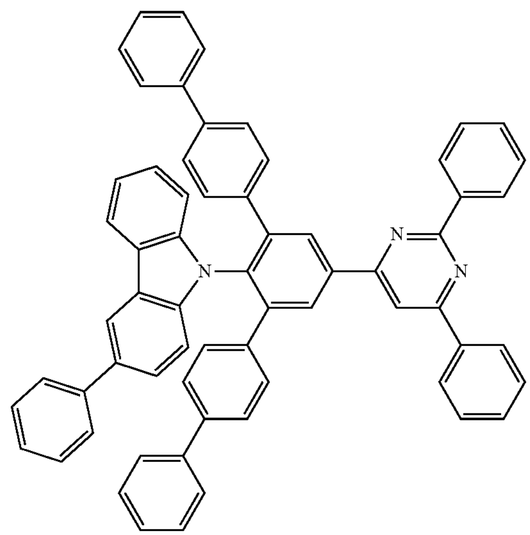
870
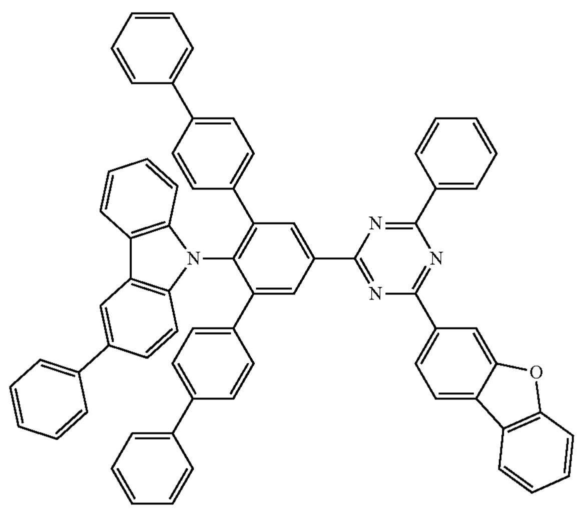
871
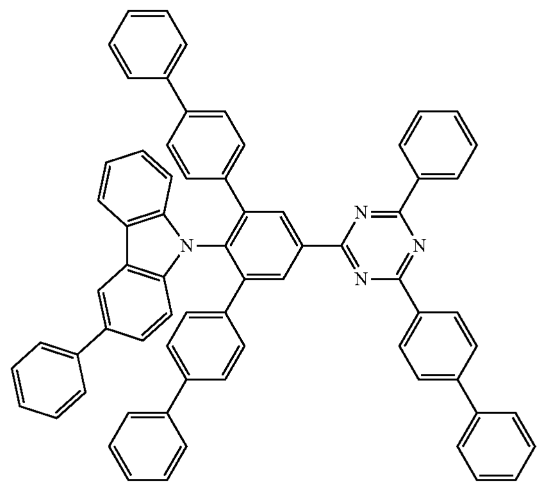

872
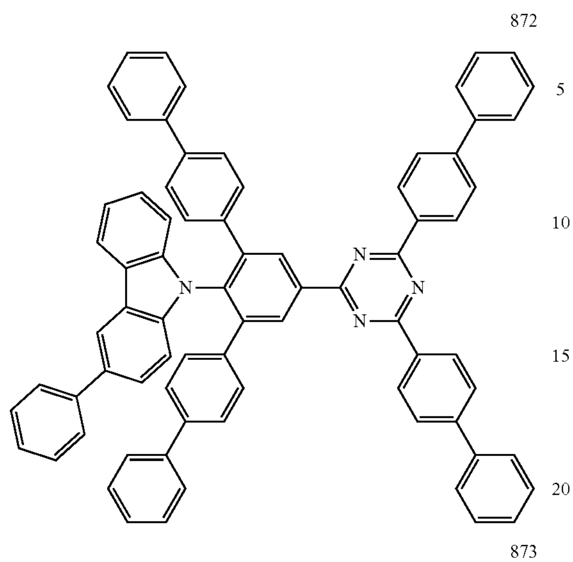
873
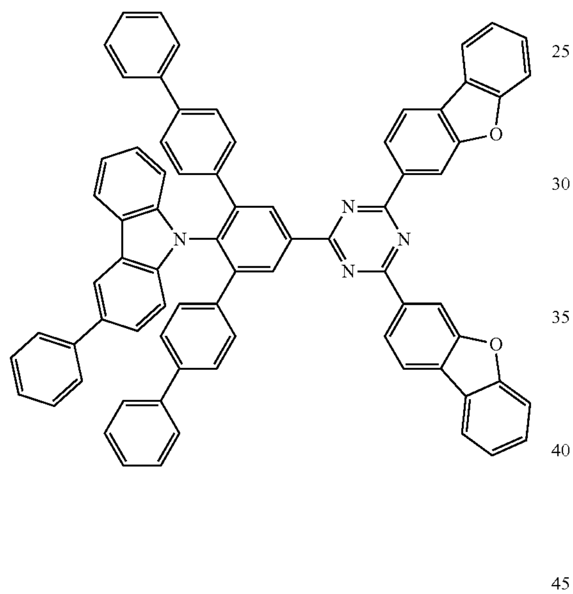
874
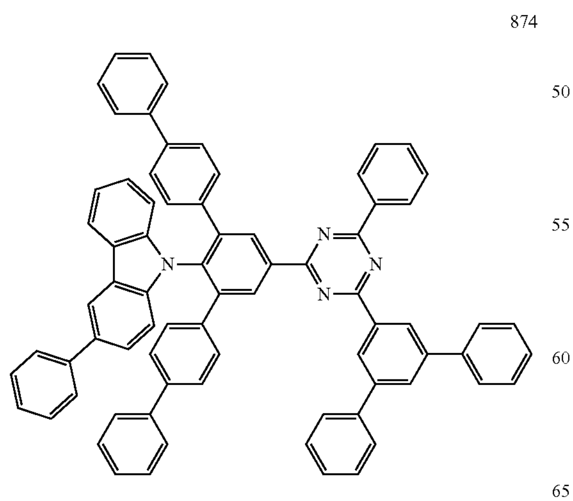
875
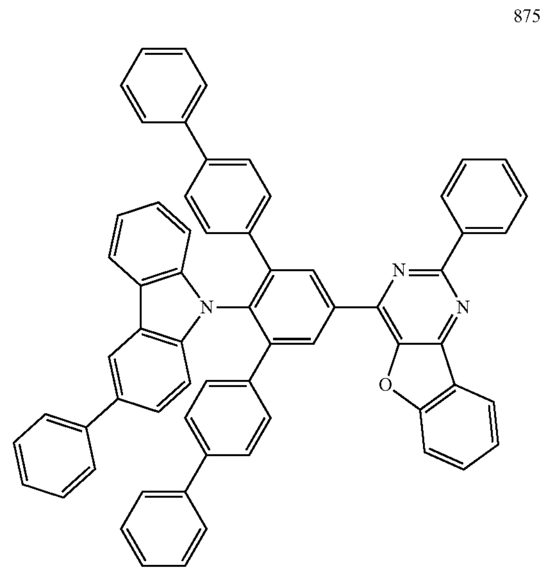
876
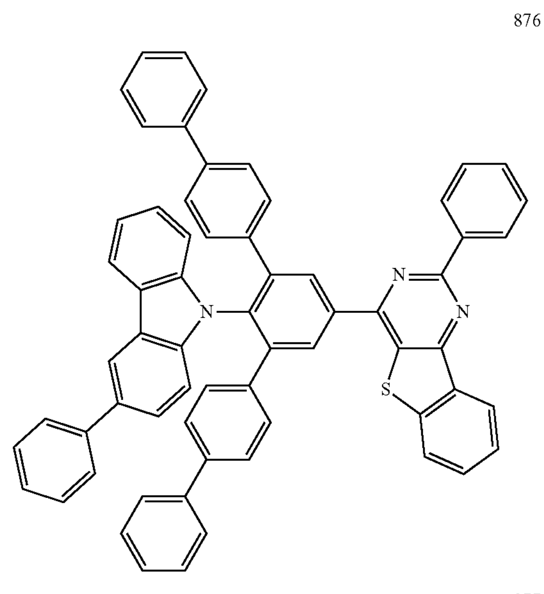
877
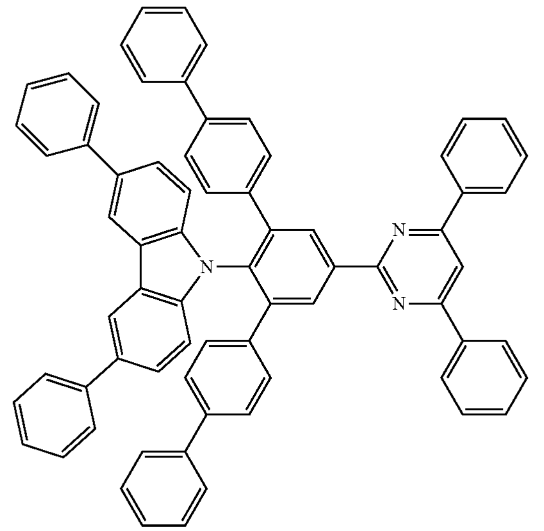

-continued
878
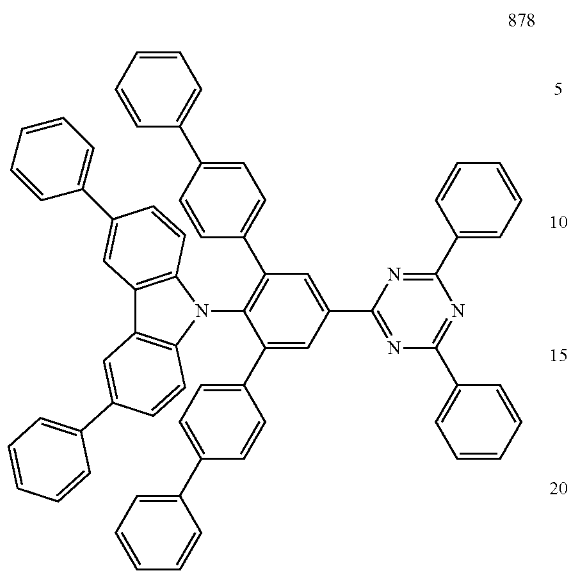
879
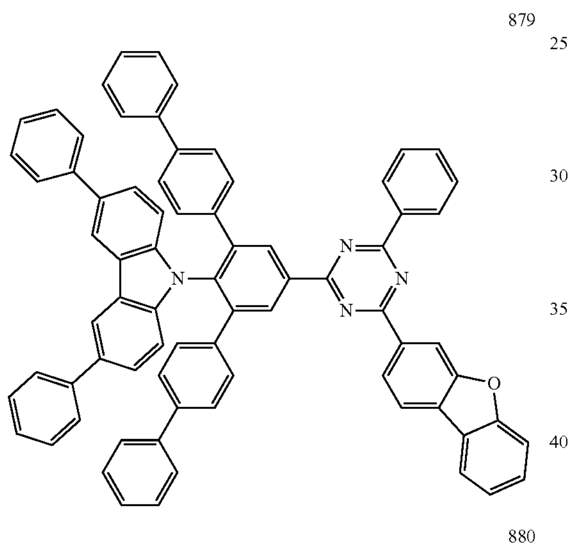
880
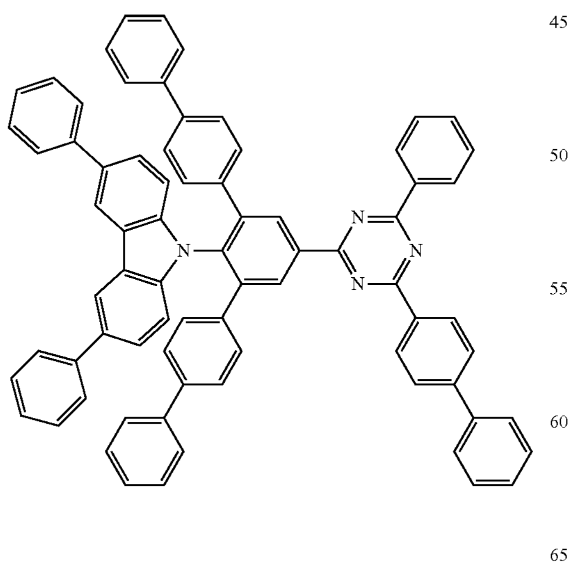
-continued
881
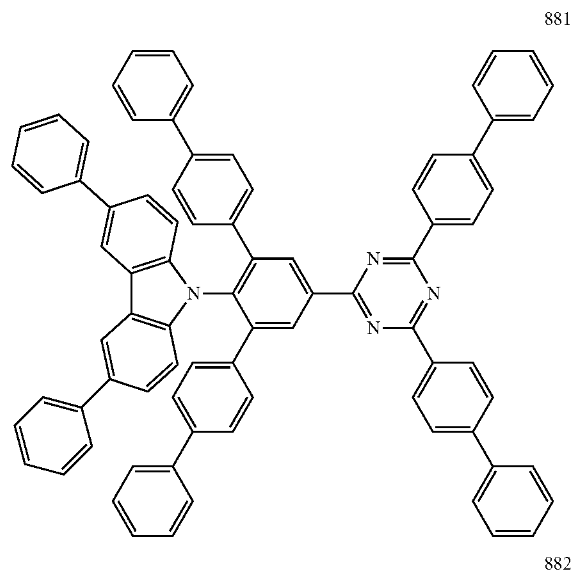
882
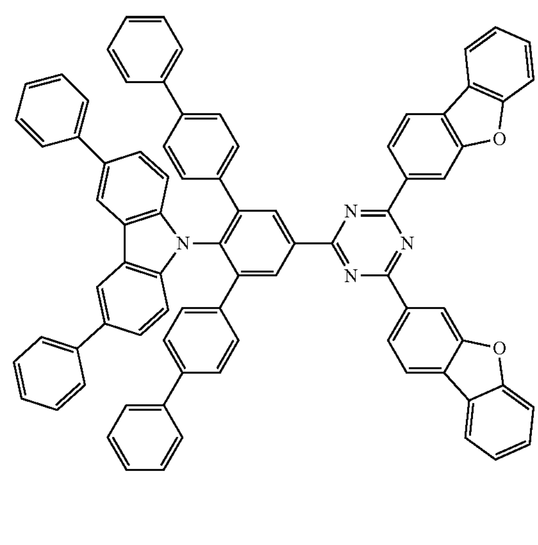
883
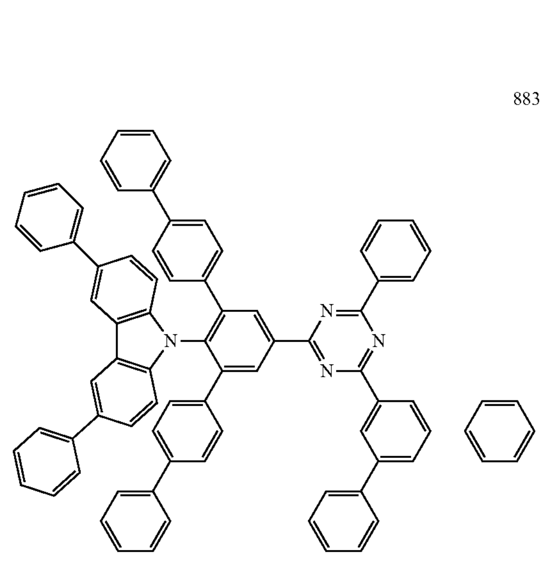

884
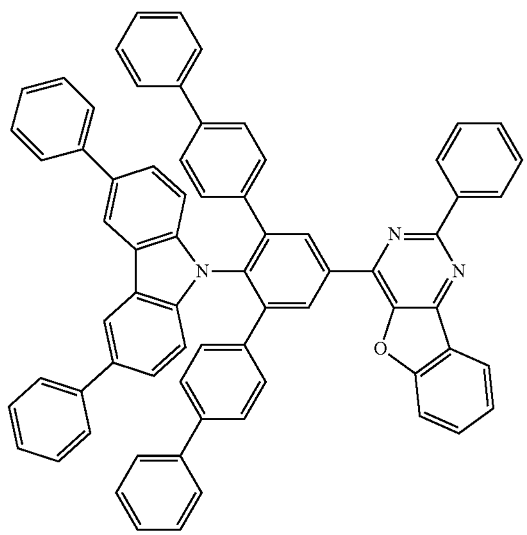
885
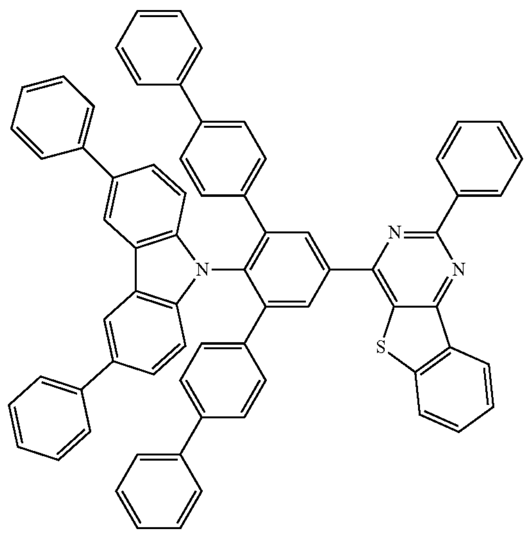
886
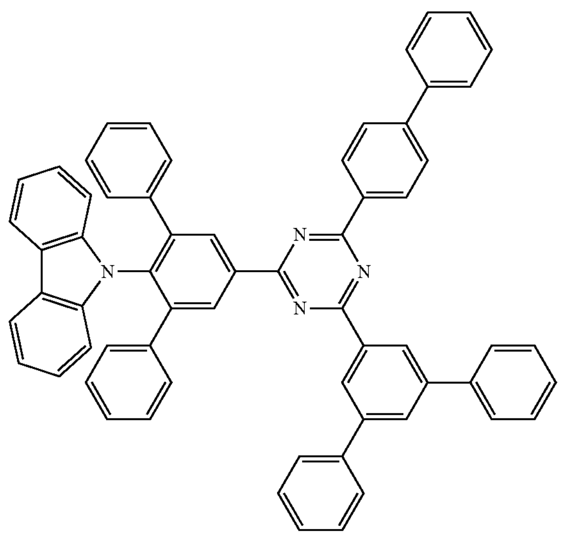
887
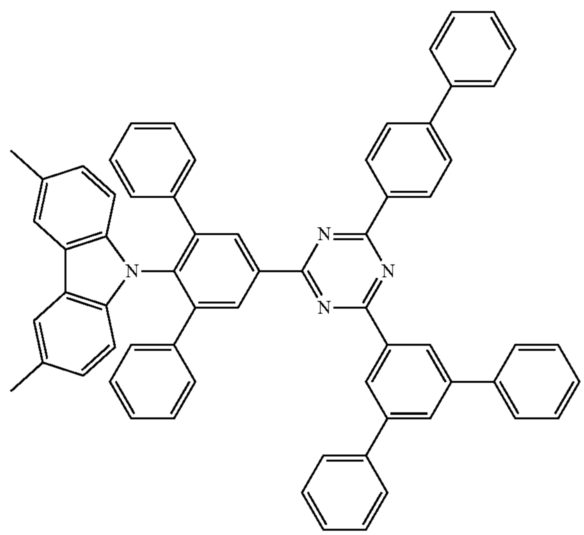
888
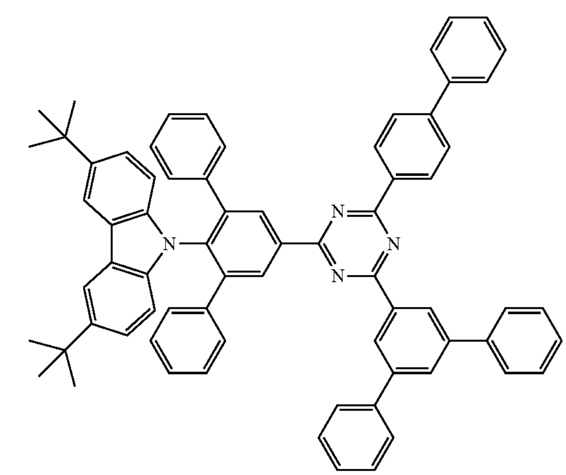
889
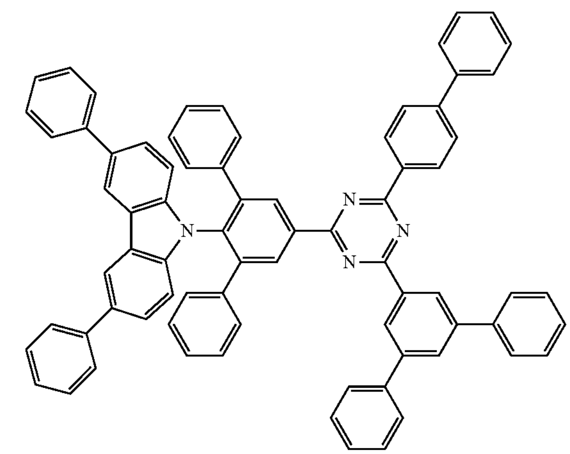

-continued
890
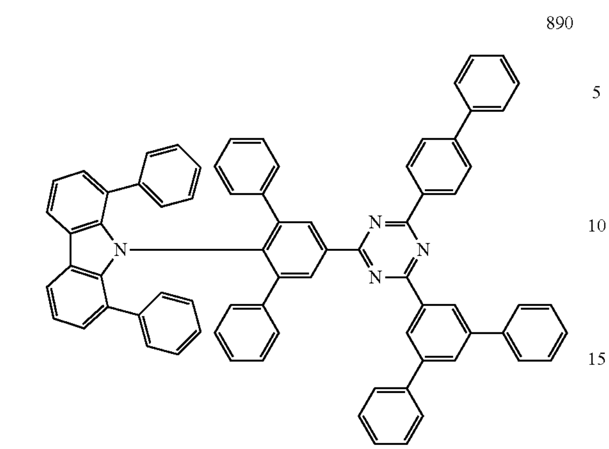
891
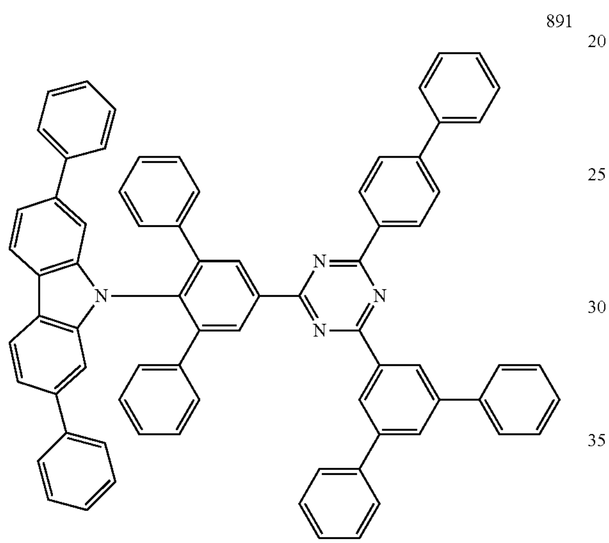
892
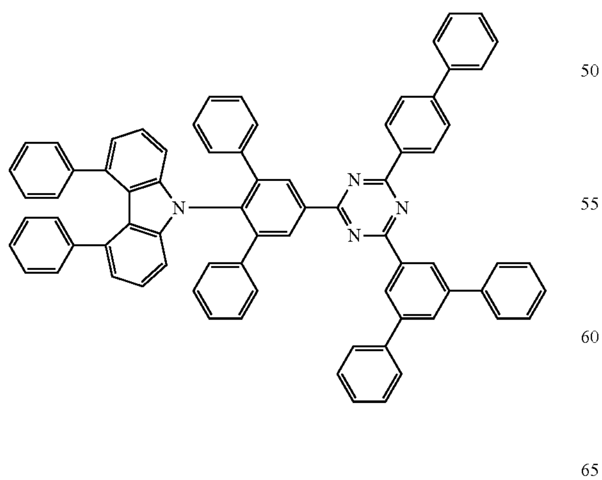
-continued
893
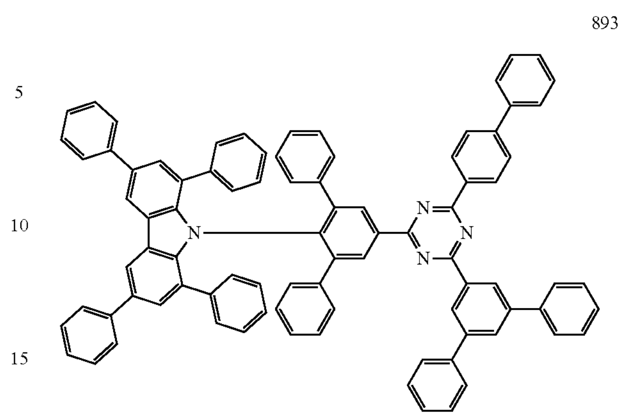
894
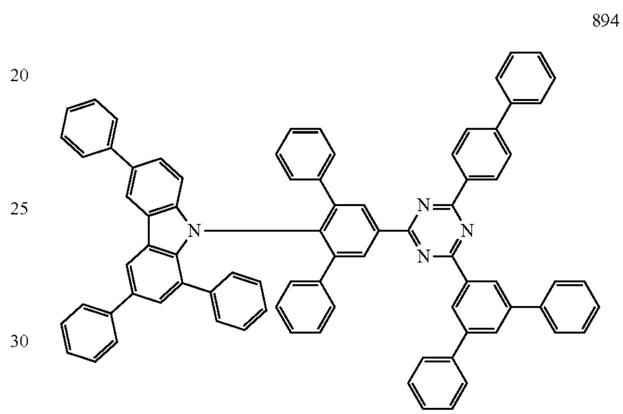
895
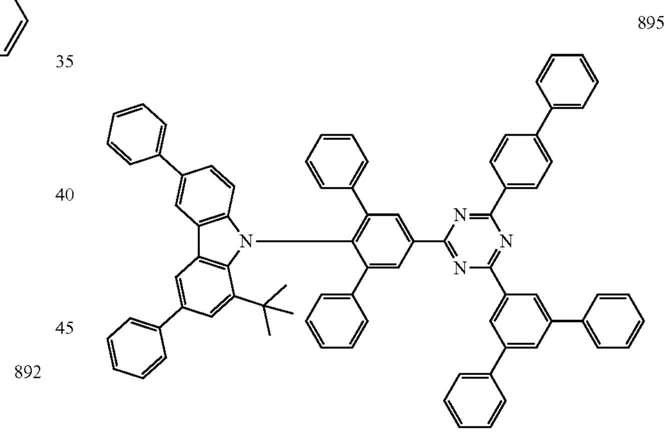
896
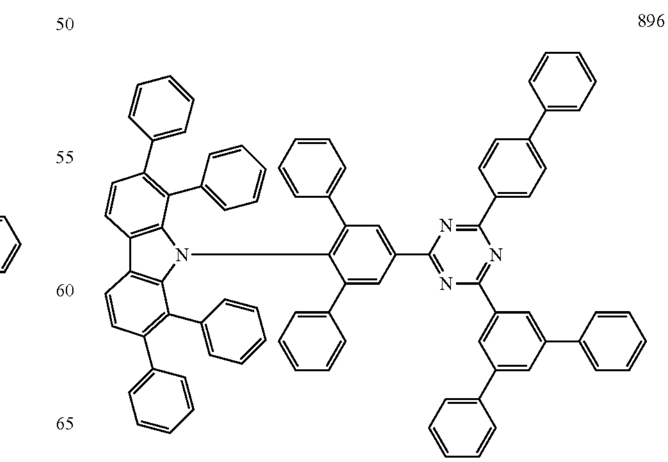

-continued
897
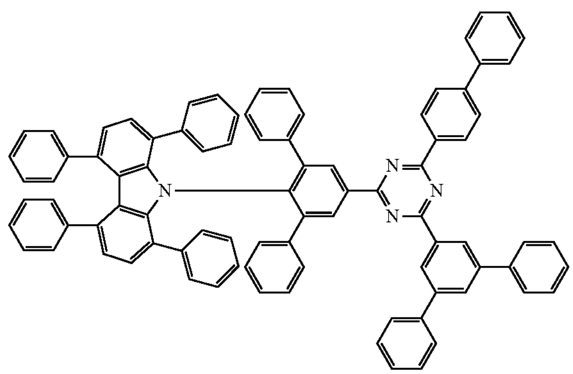
898
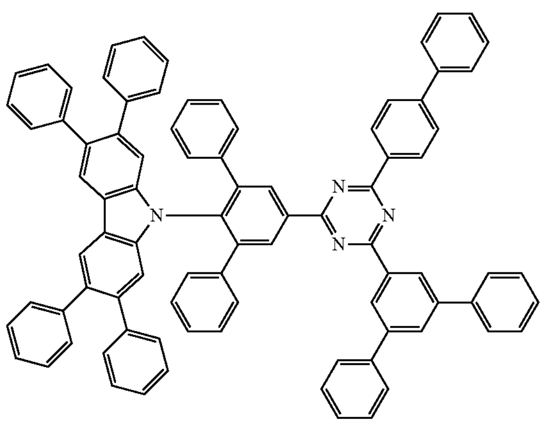
899
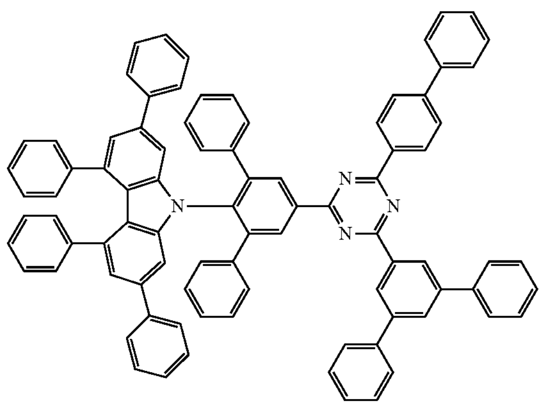
-continued
900
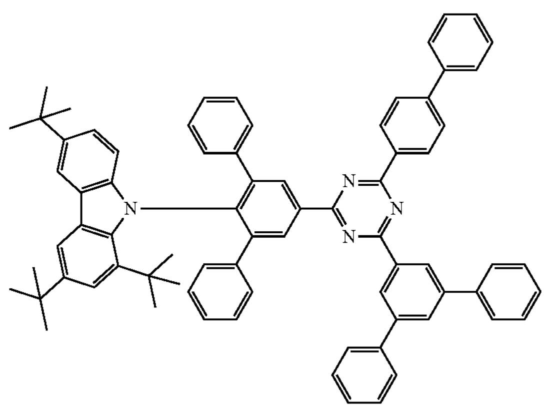
901
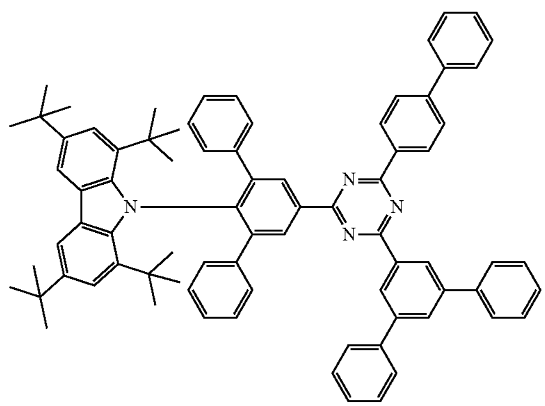
902
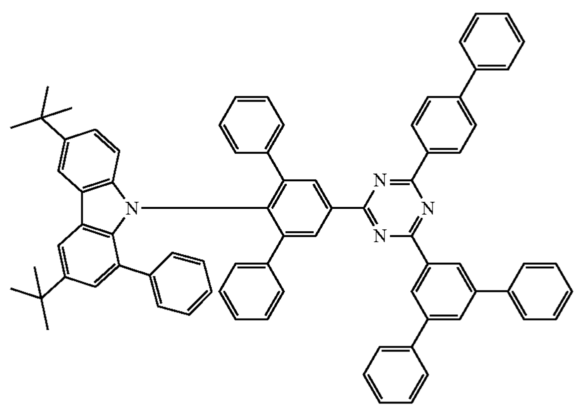

-continued
903
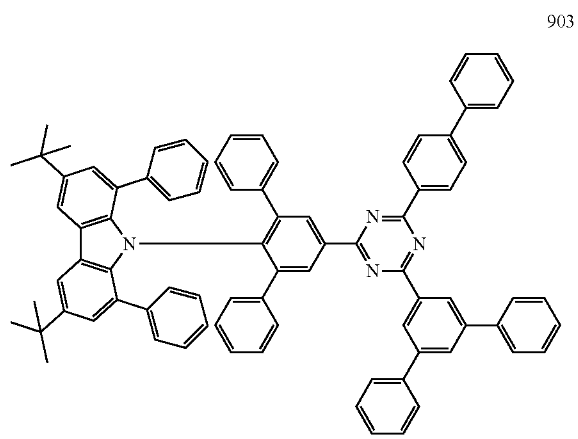
904
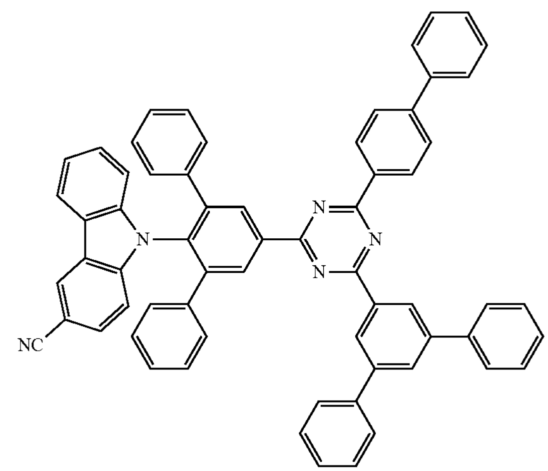
905
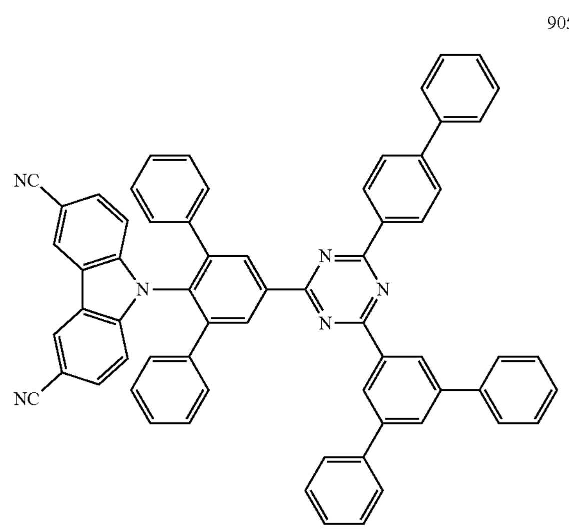
-continued
906
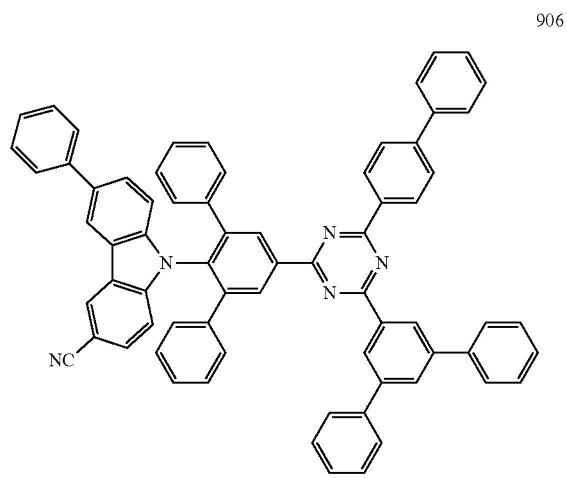
907
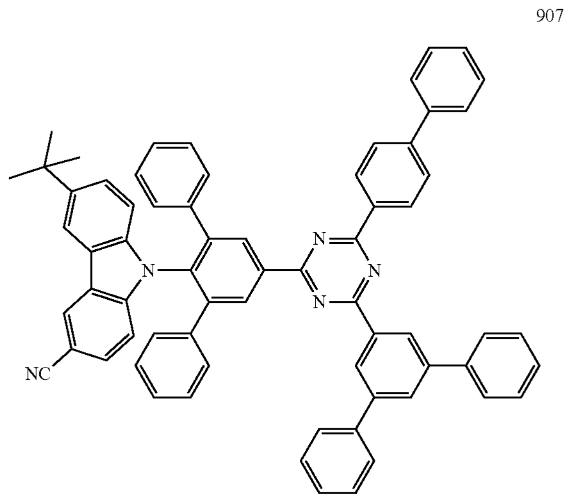
908
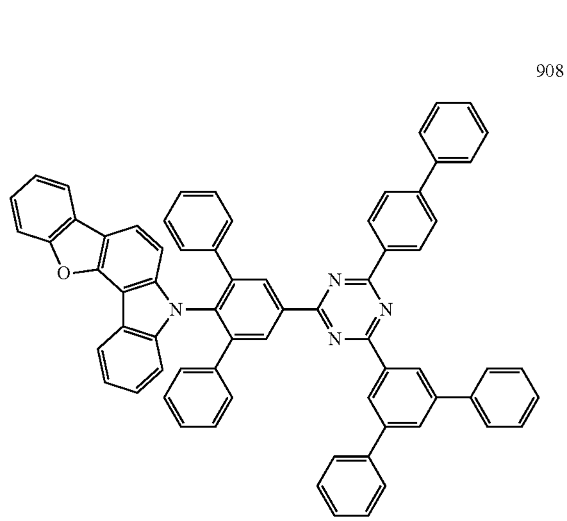

-continued
909
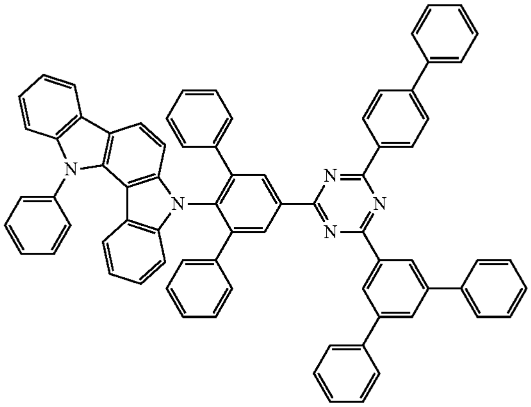
910
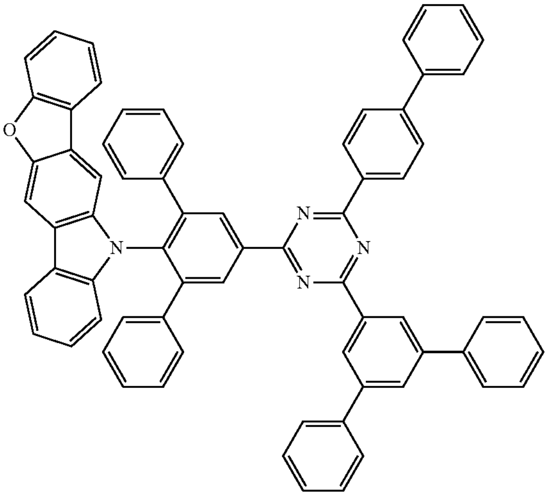
911
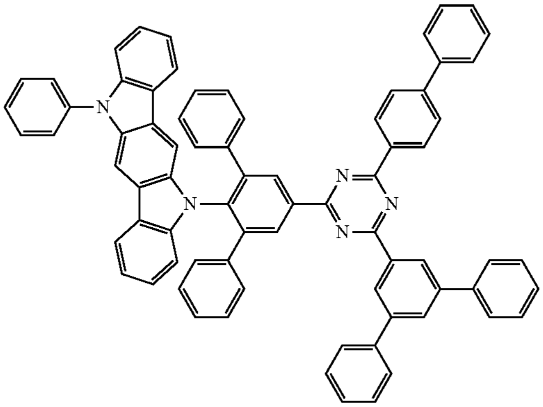
-continued
912
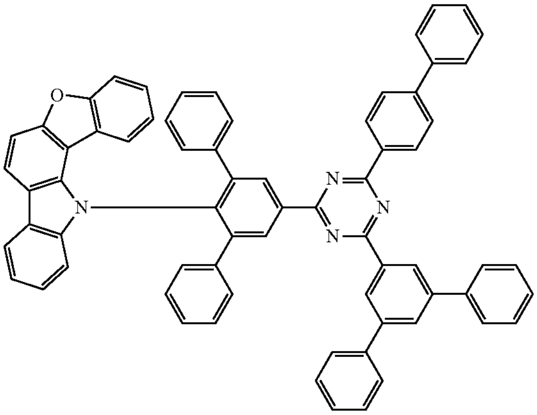
913
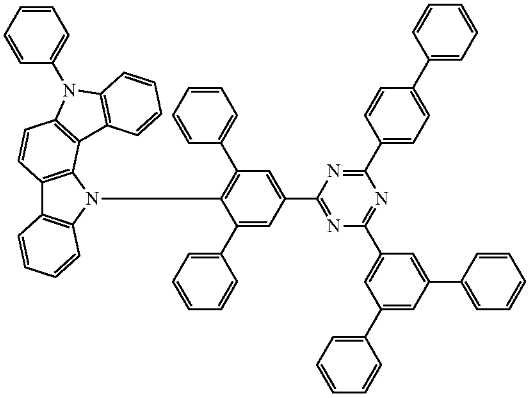
914
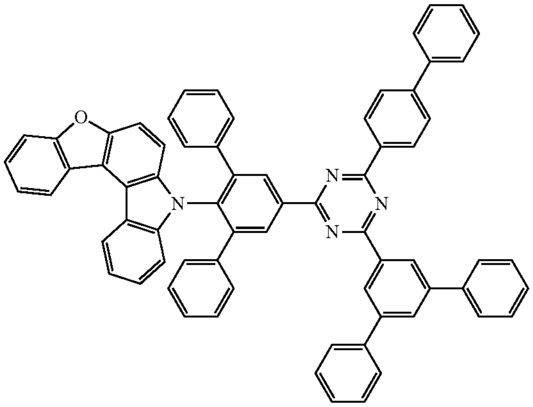

-continued
915
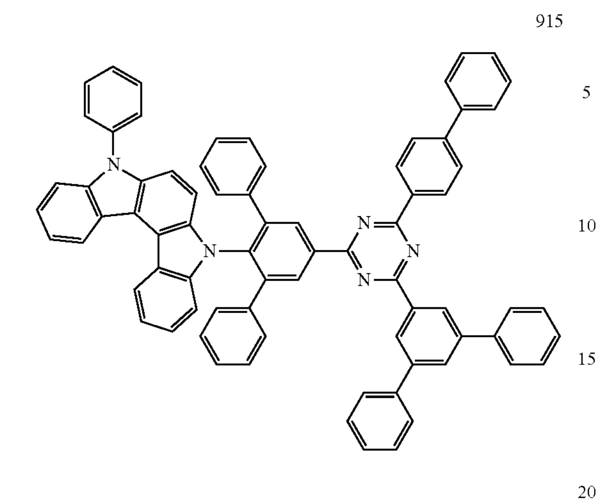
916
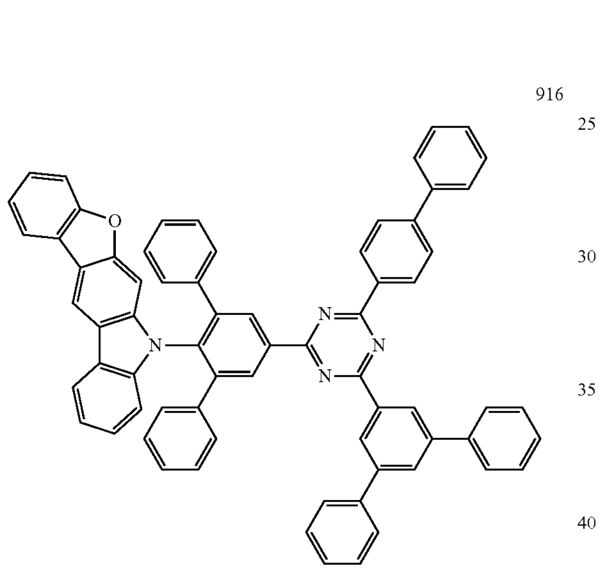
917
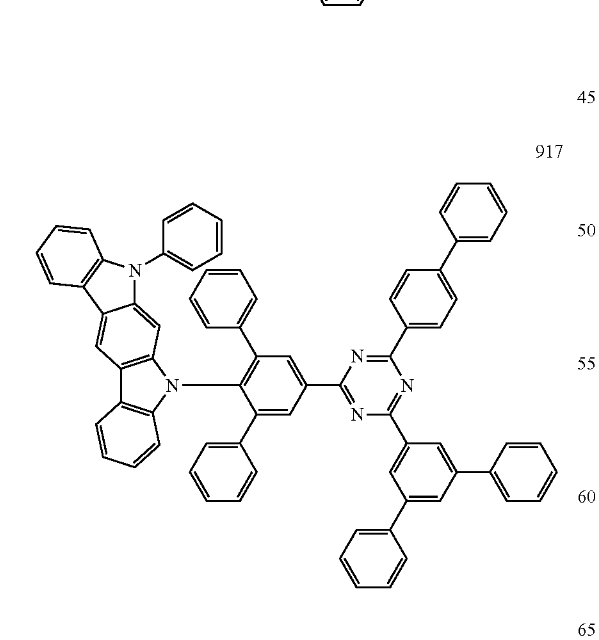
-continued
918
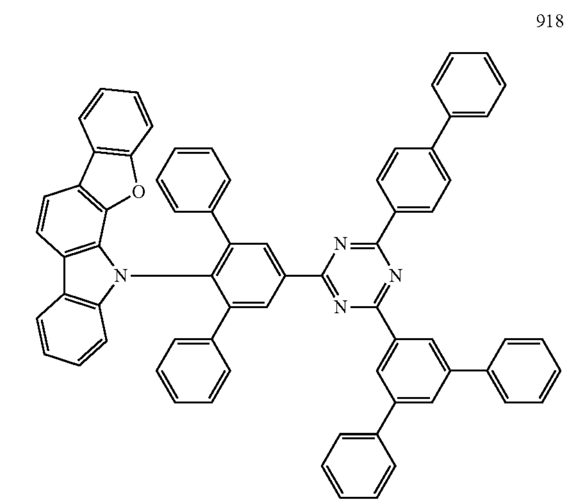
919
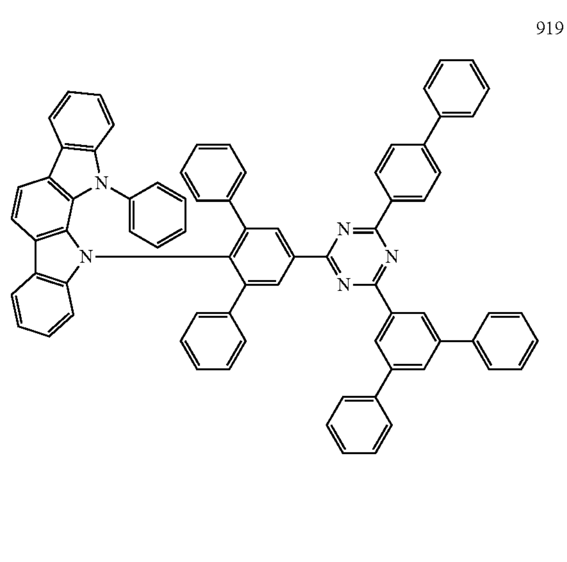
920
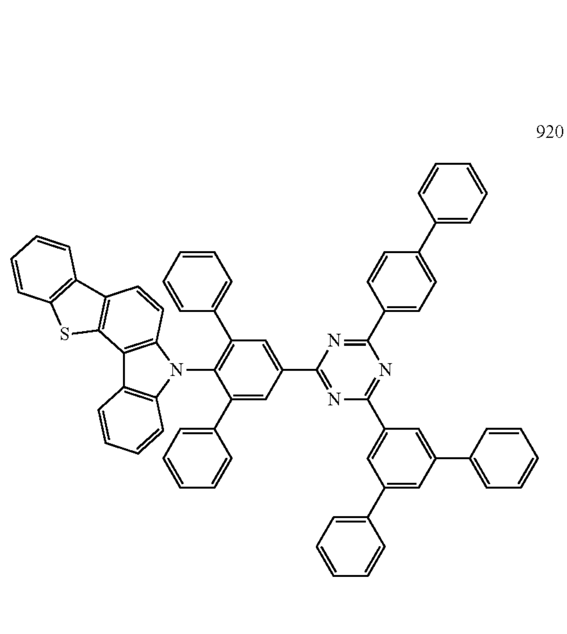

-continued
921
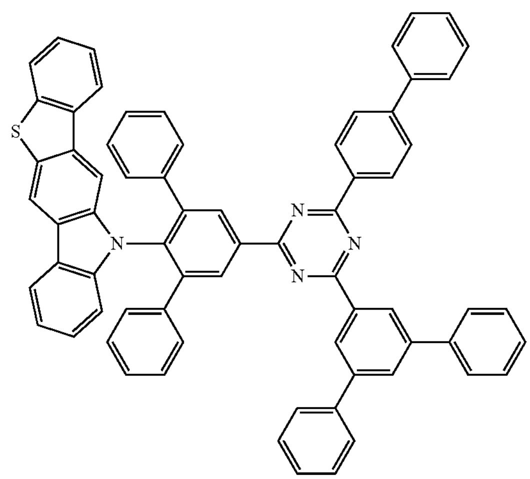
922
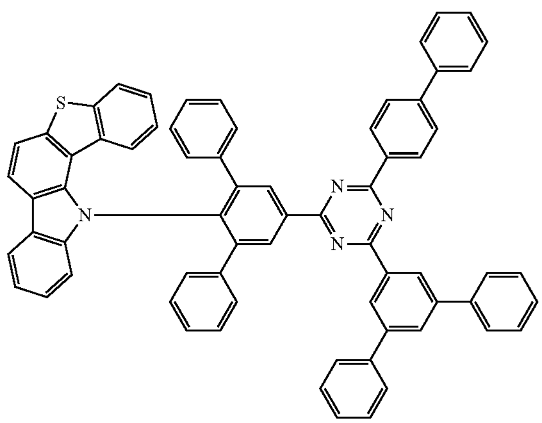
923
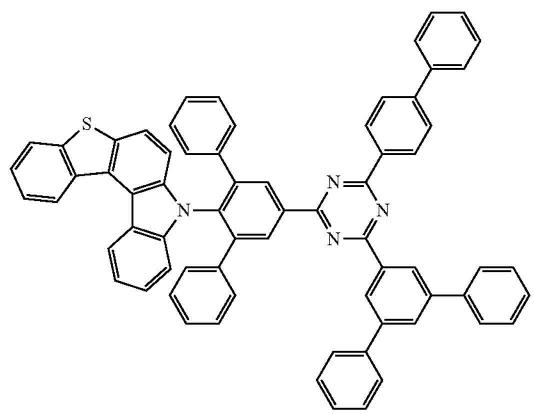
-continued
924
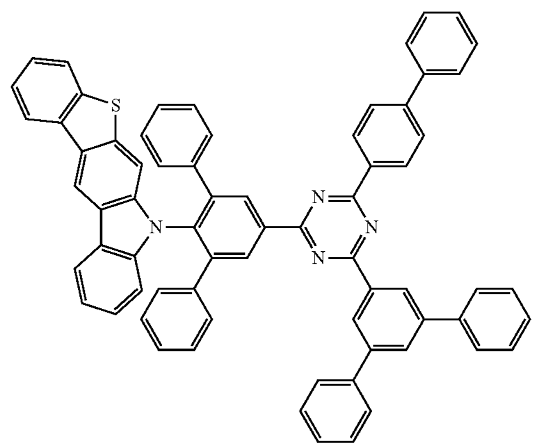
925
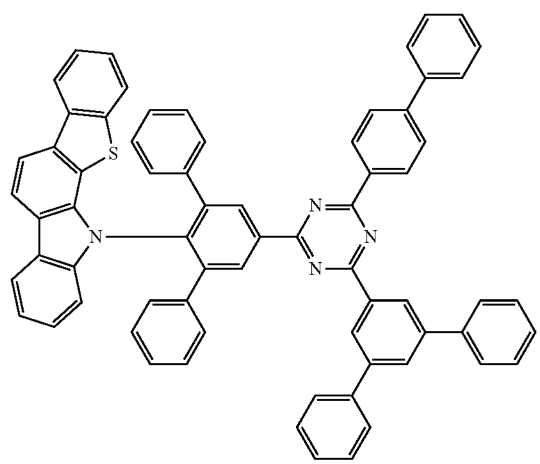
926
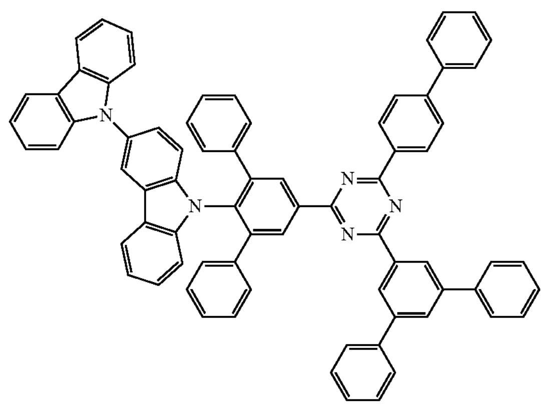

-continued
927
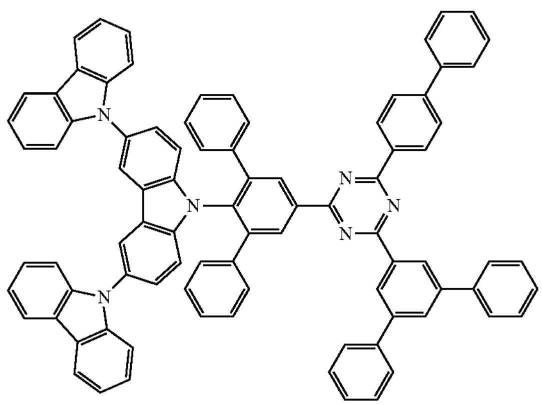
928
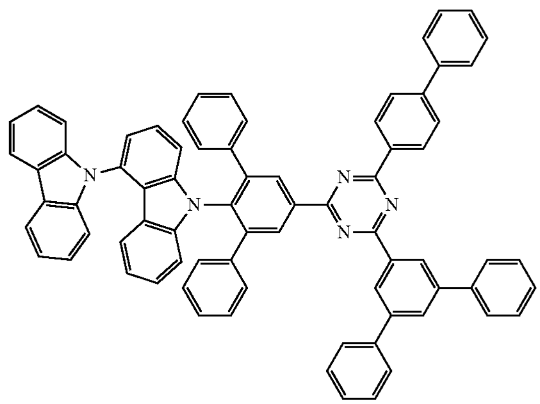
929
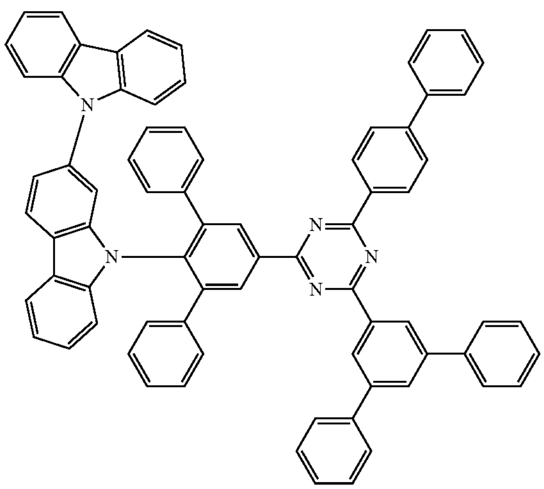
-continued
930
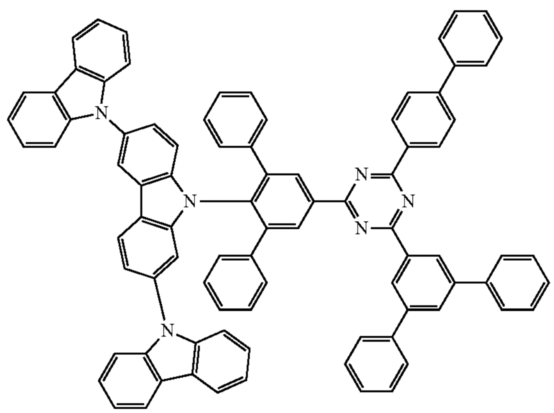
931
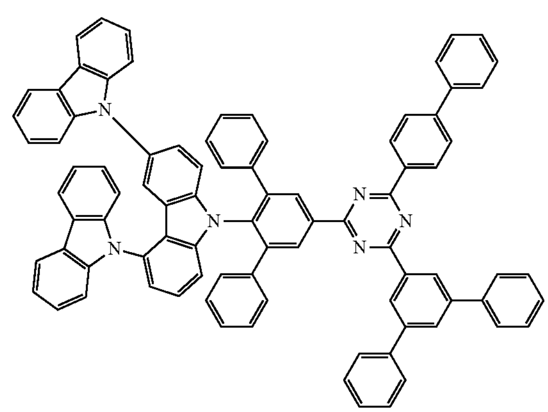
932
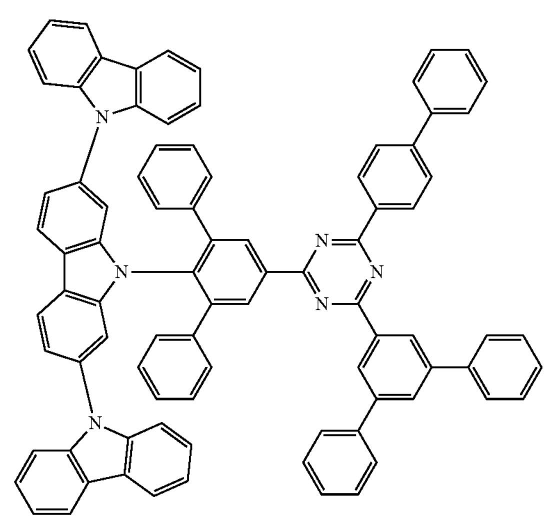

-continued
933
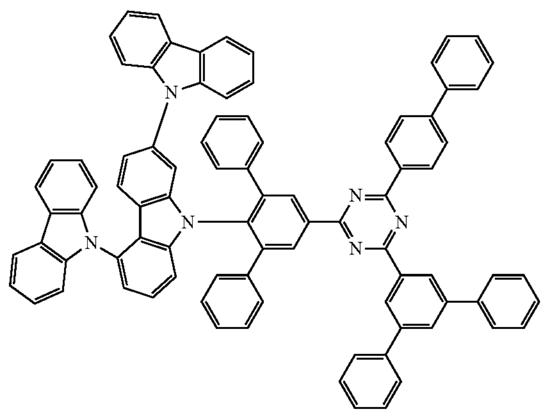
934
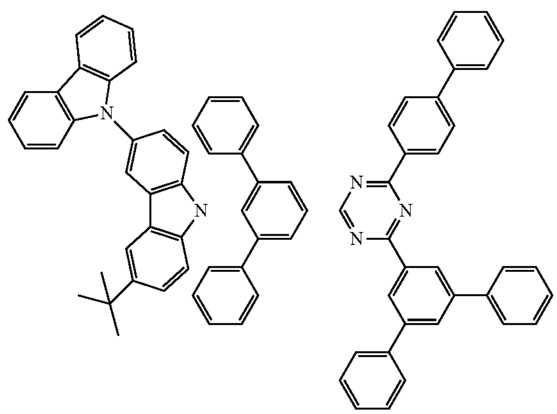
935
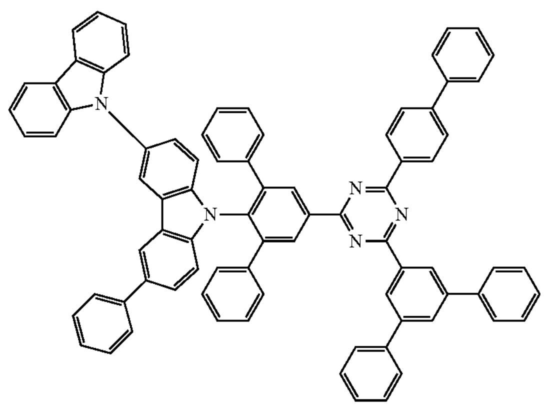
936
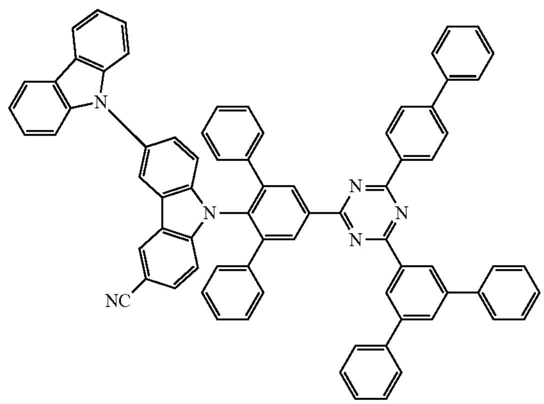
937
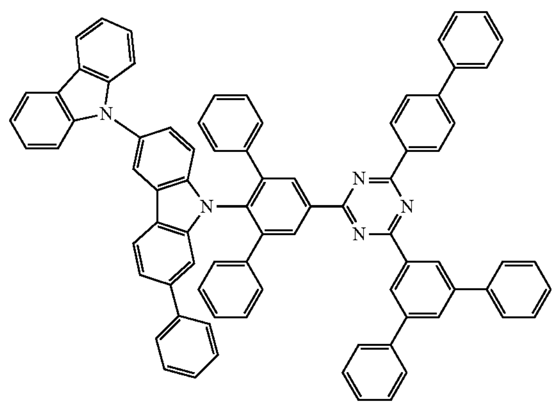
938
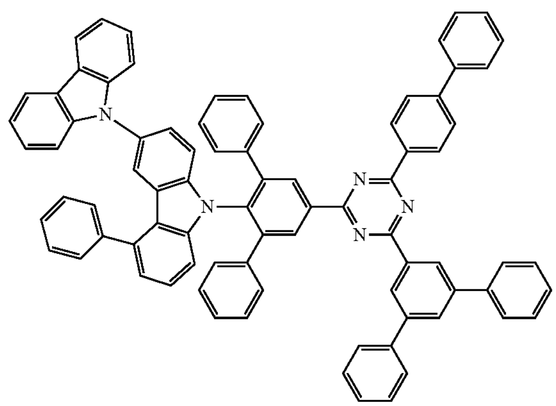

-continued
939
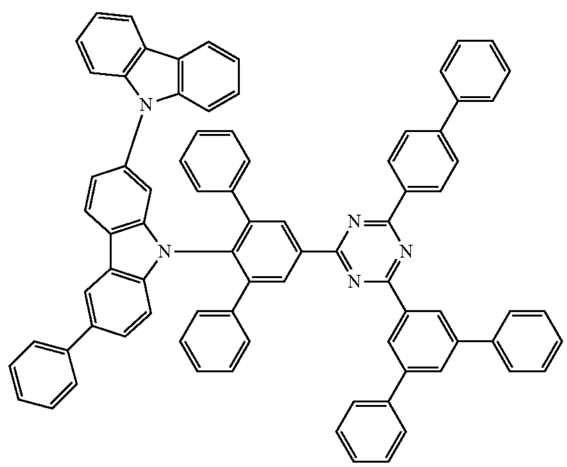
940
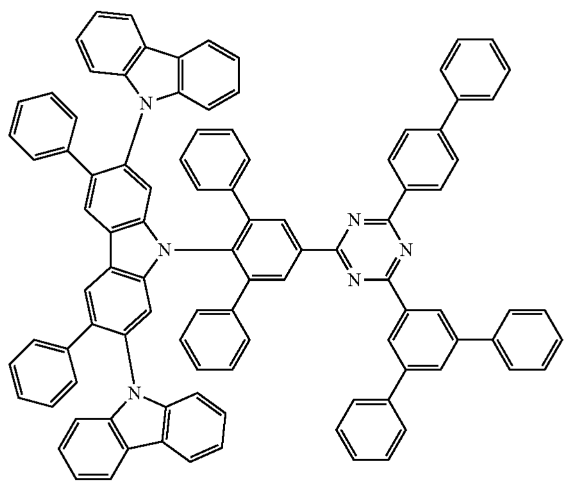
941
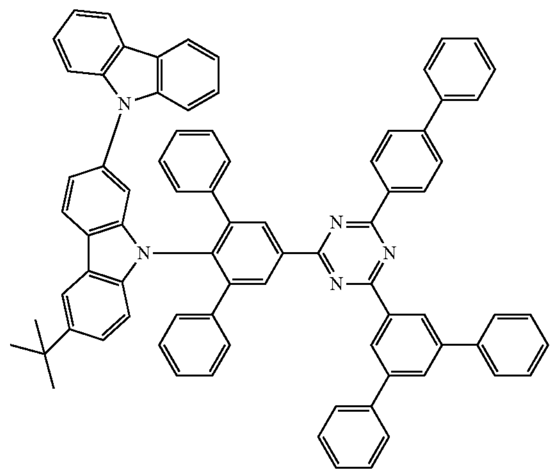
-continued
942
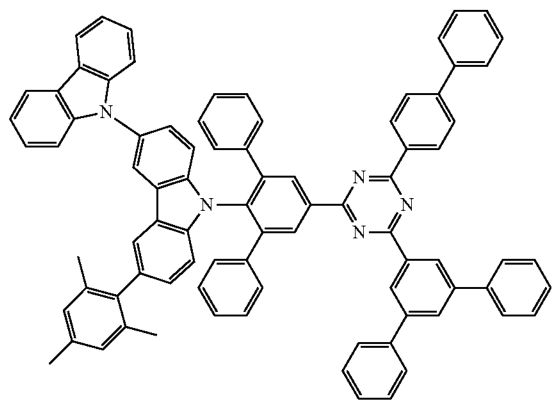
943
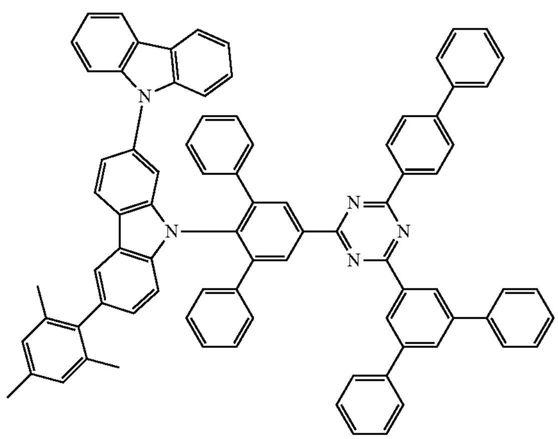
944
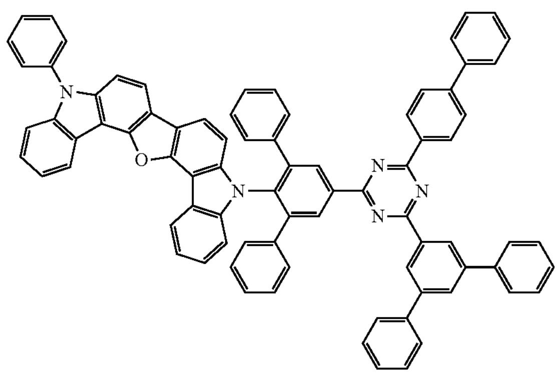
945
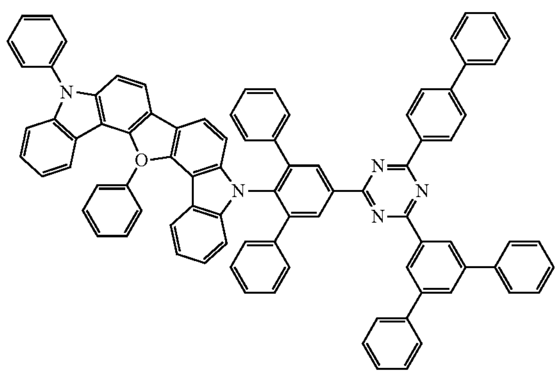

-continued
946
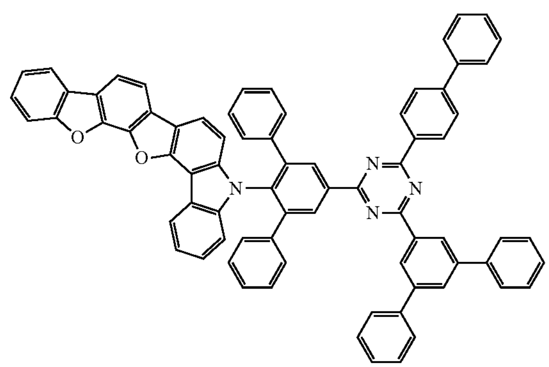
947
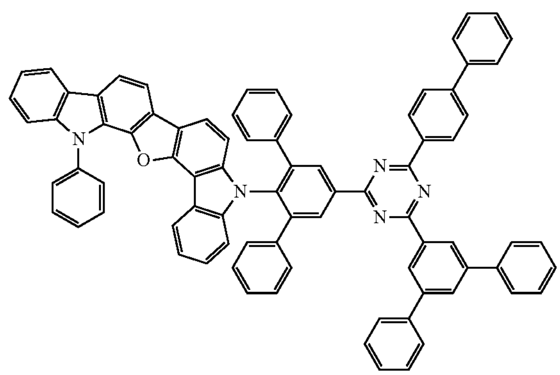
948
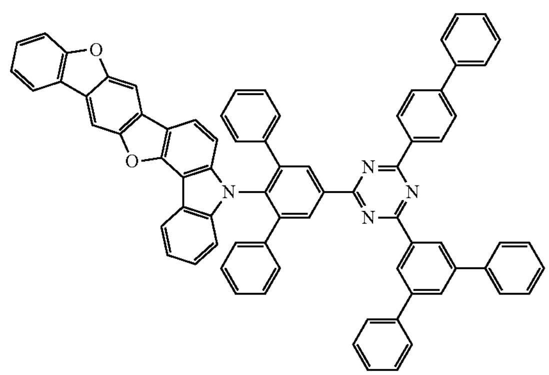
949
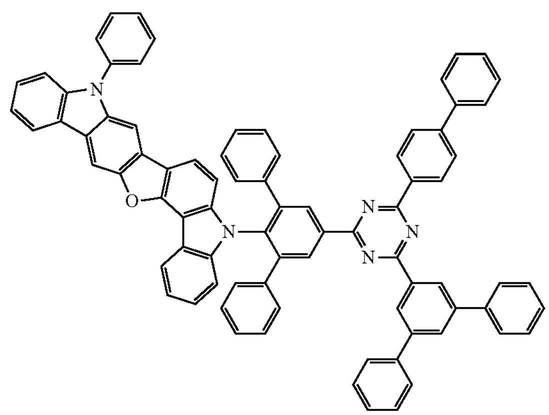
-continued
950
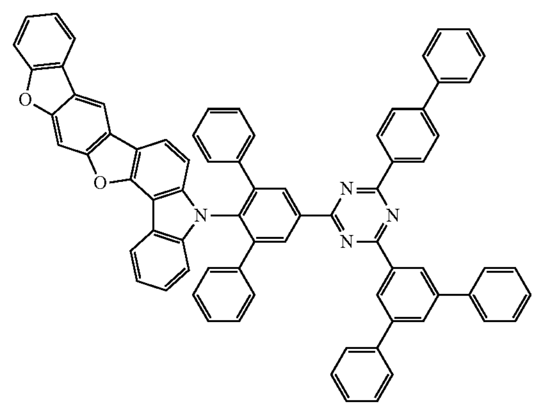
951
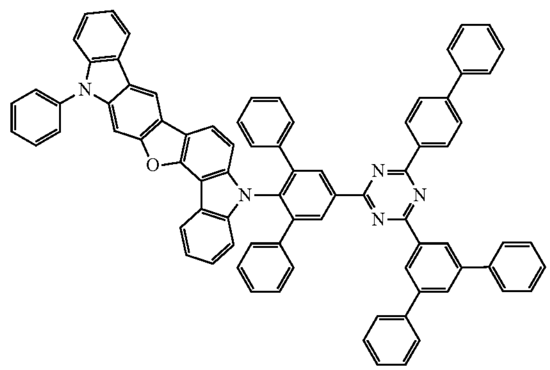
952
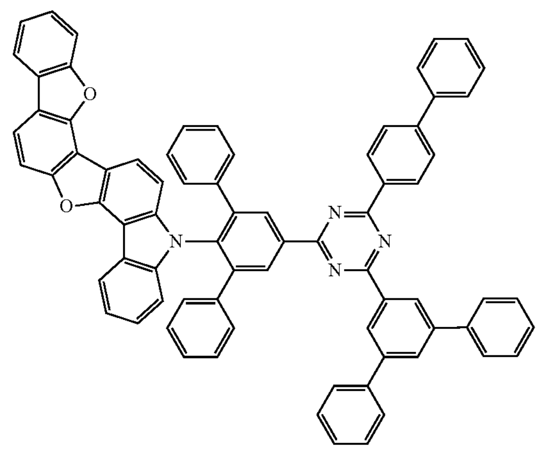

-continued
953
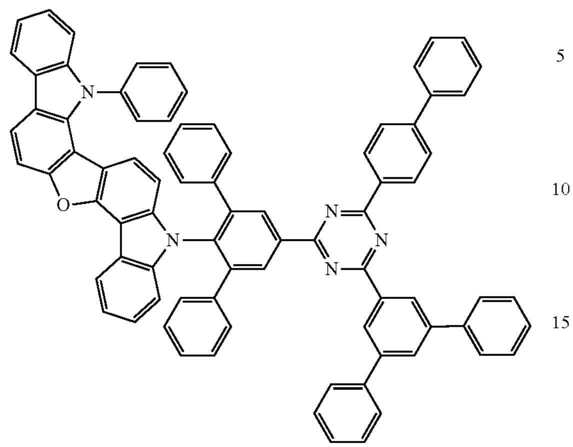
954
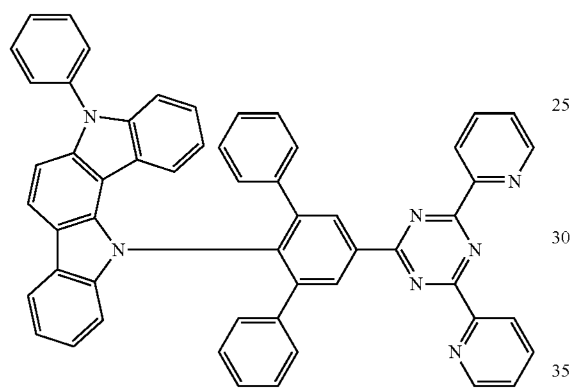
955
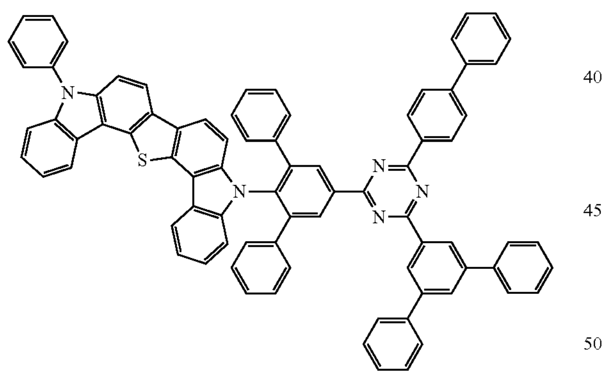
956
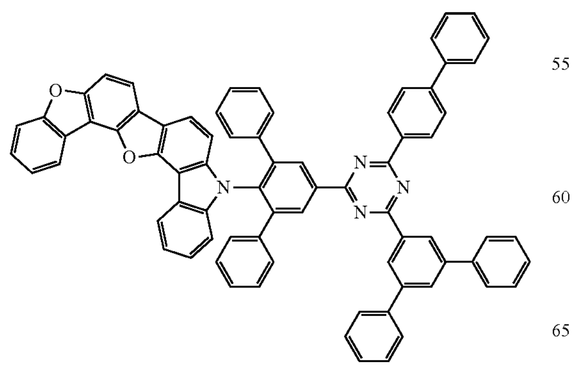
-continued
957
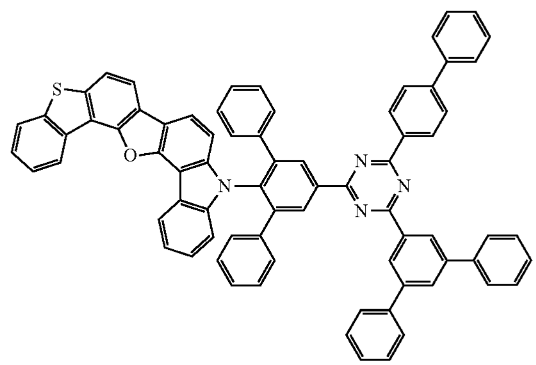
958
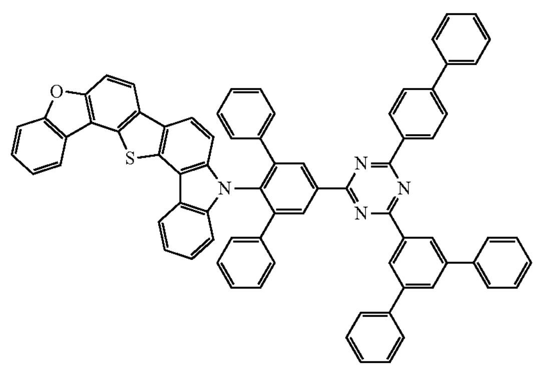
959
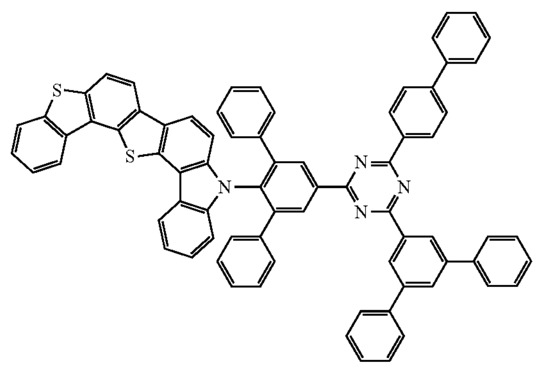
960
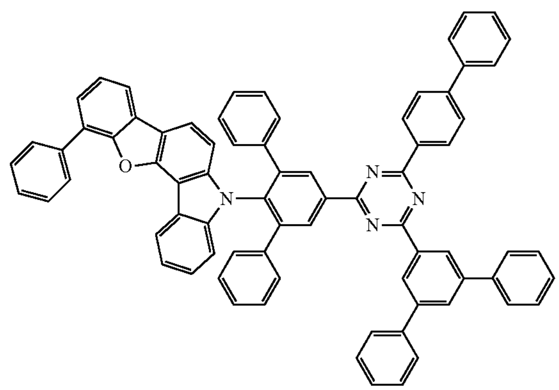

-continued
961
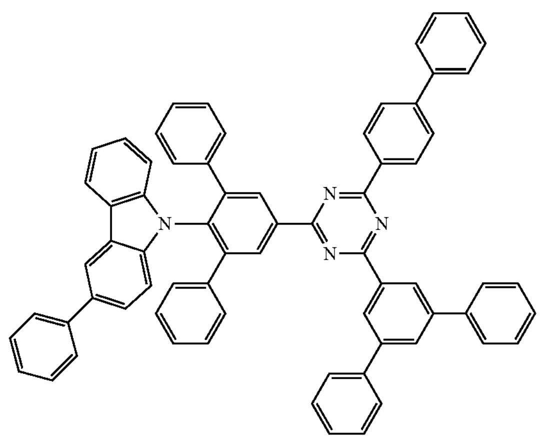
962
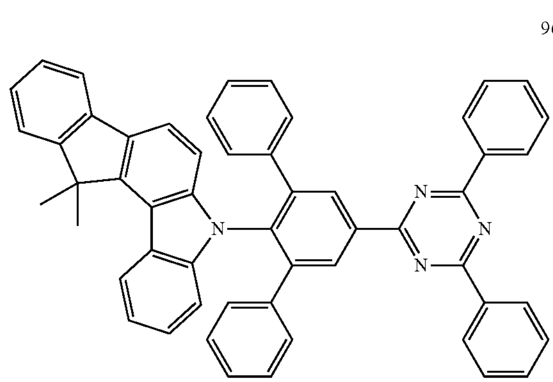
963
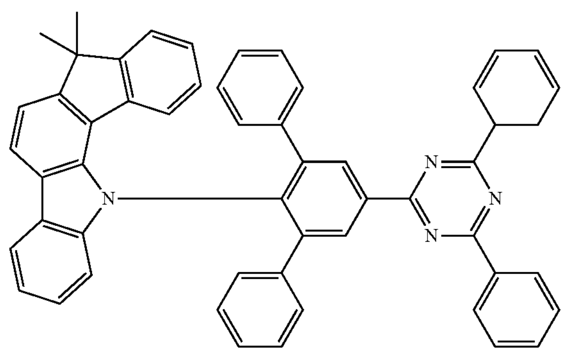
964
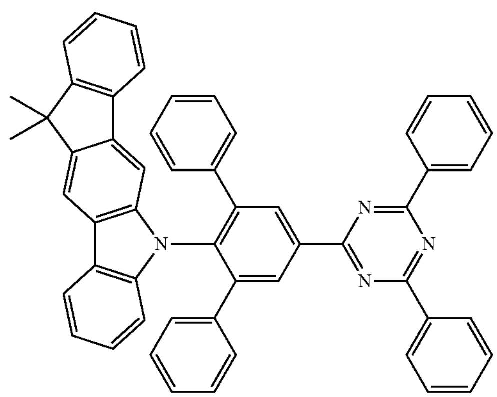
-continued
965
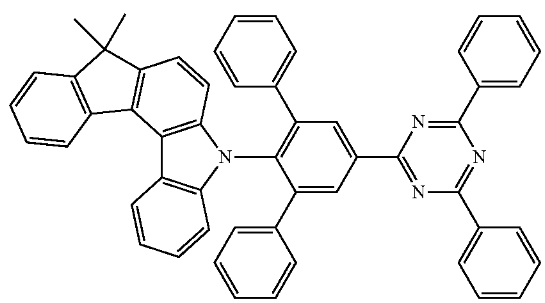
966
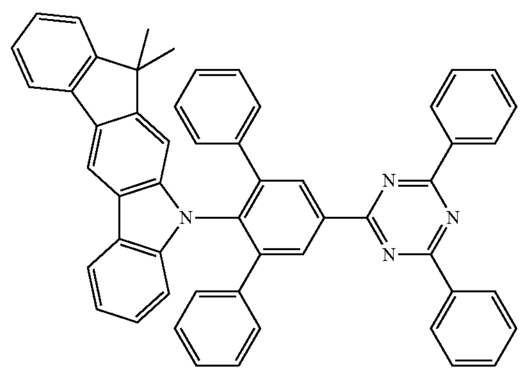
967
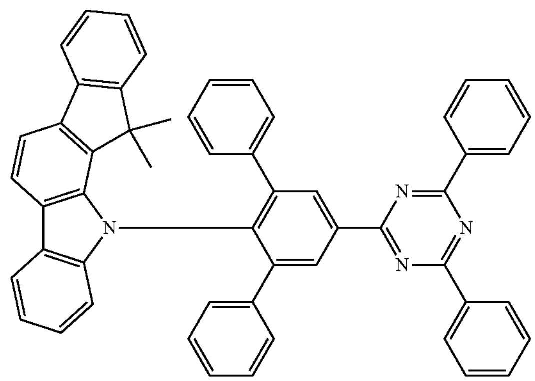
968
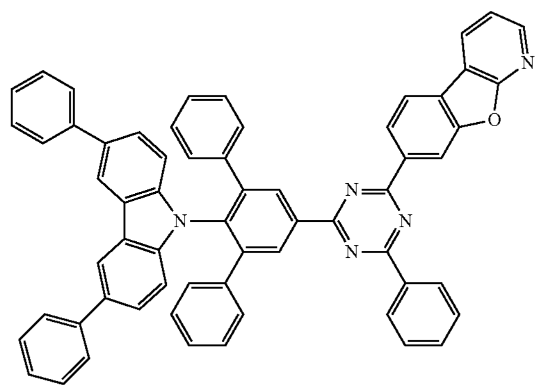

-continued
969
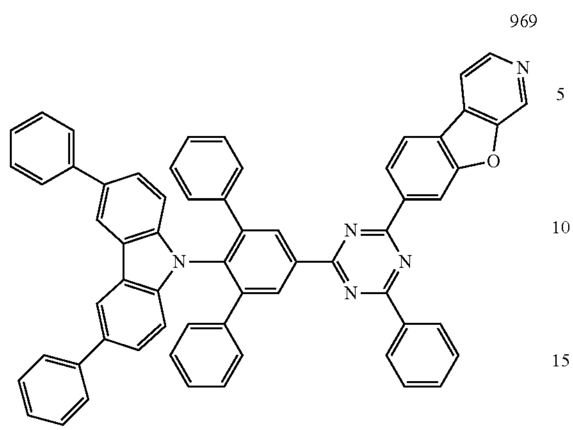
970
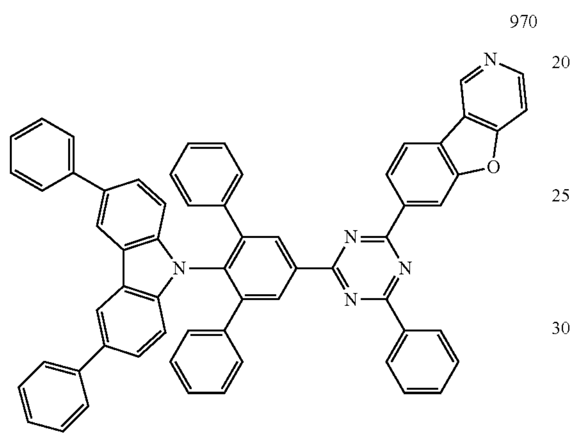
971
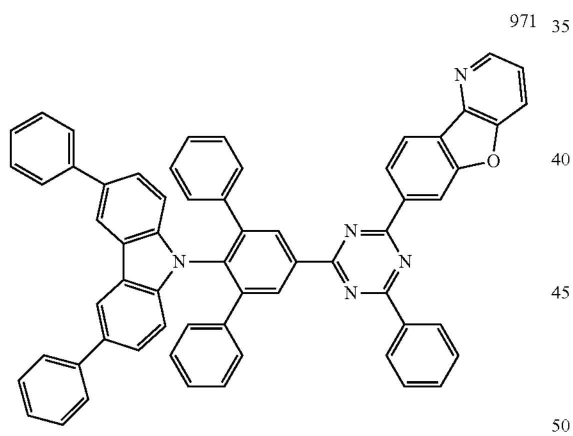
972
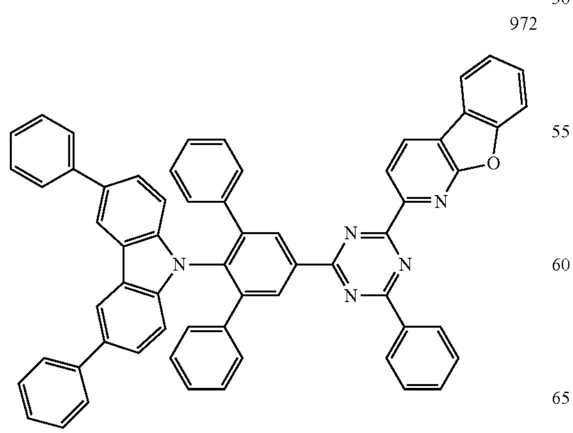
-continued
973
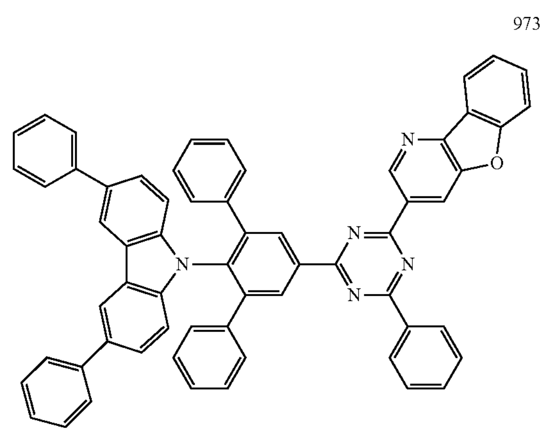
974
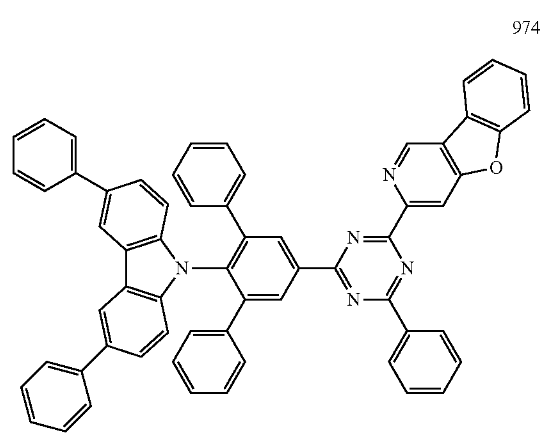
975
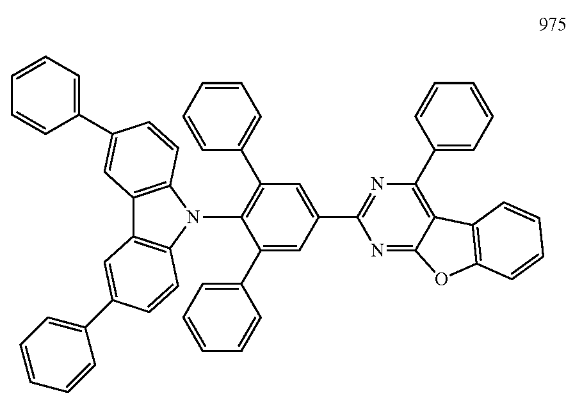
976
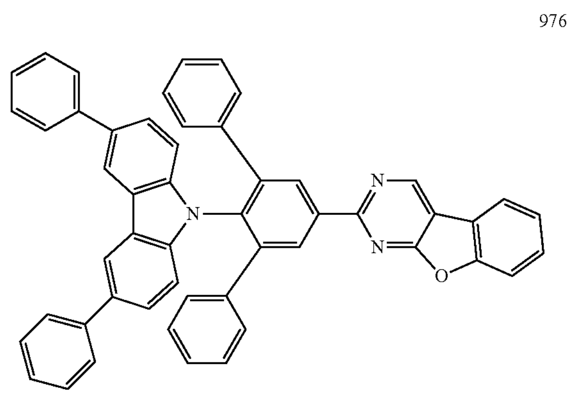

-continued
977
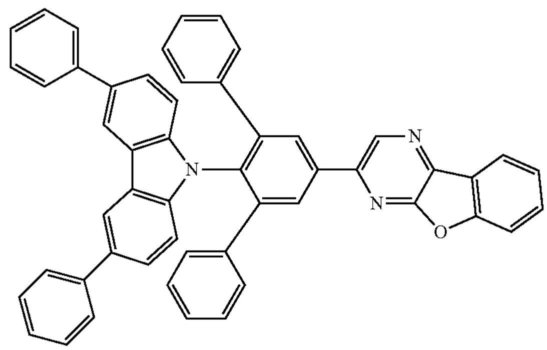
978
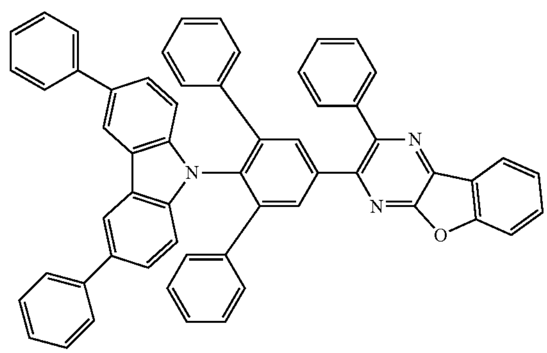
979
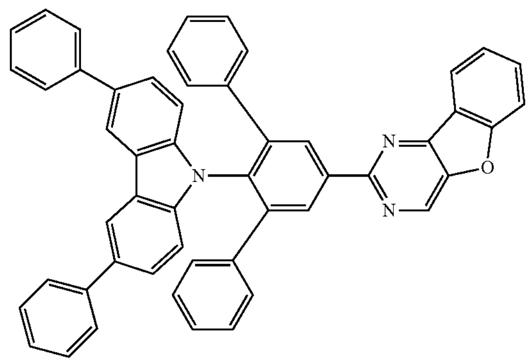
980
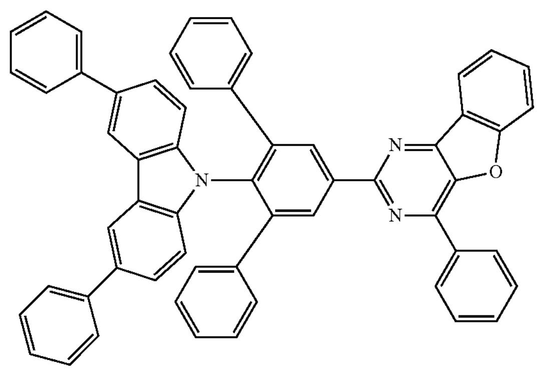
-continued
981
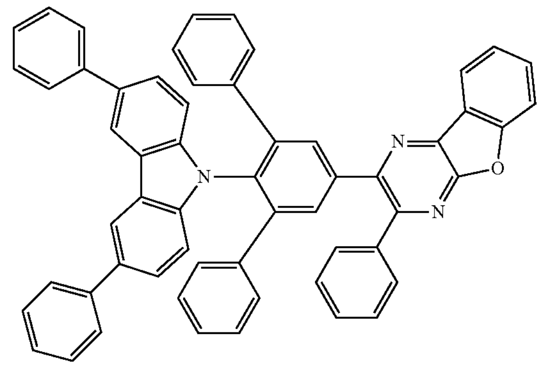
982
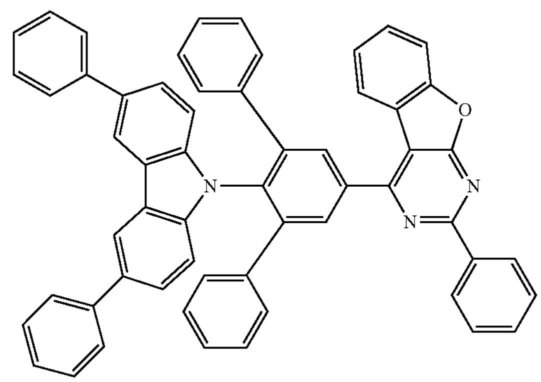
983
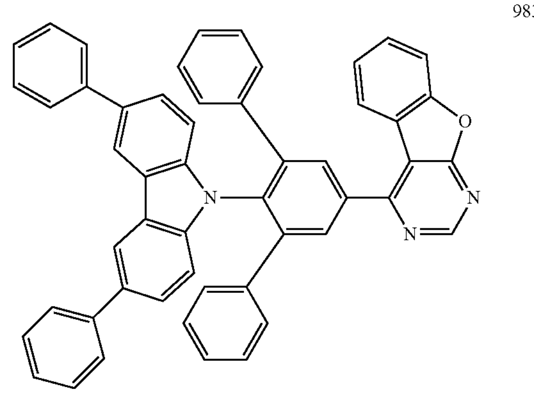
984
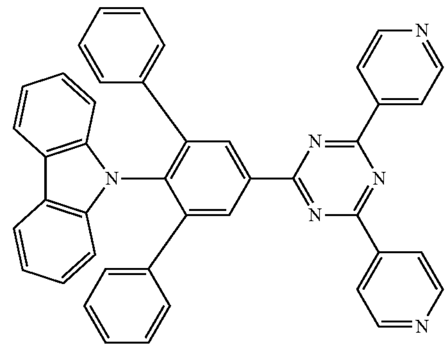

-continued
985
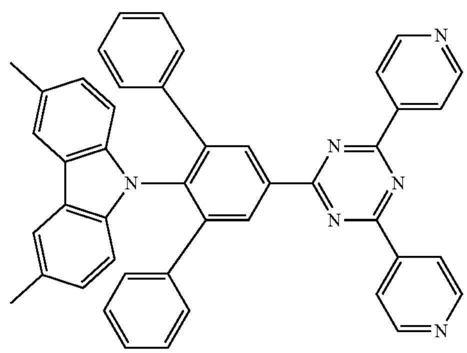
986
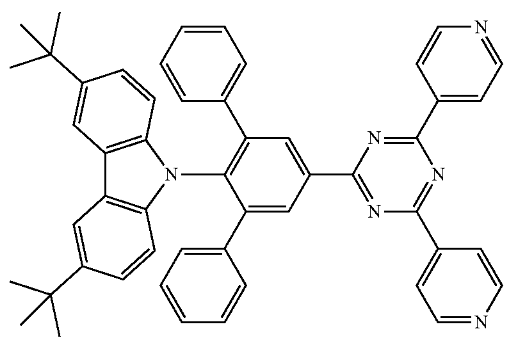
987
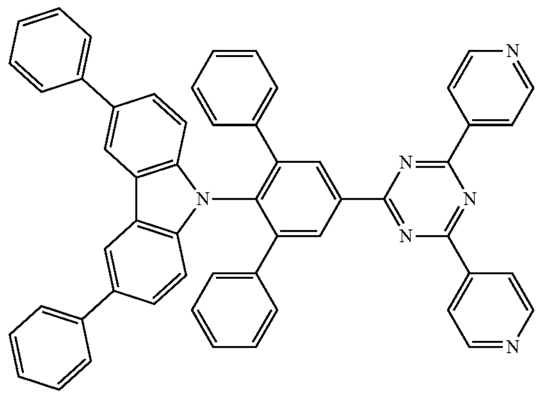
988
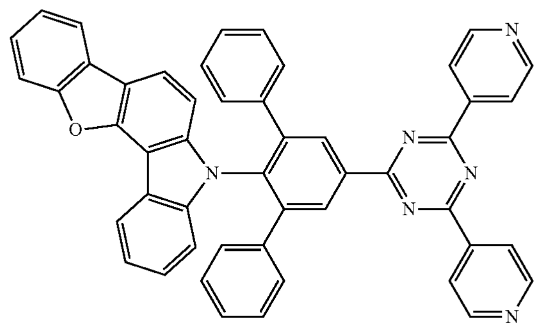
-continued
989
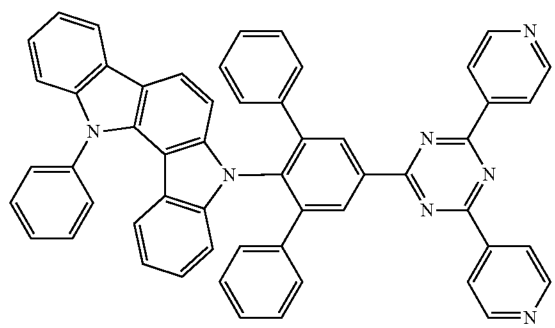
990
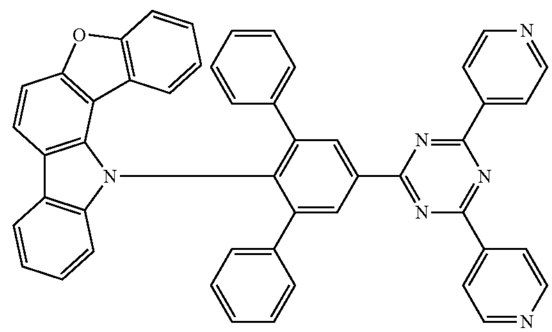
991
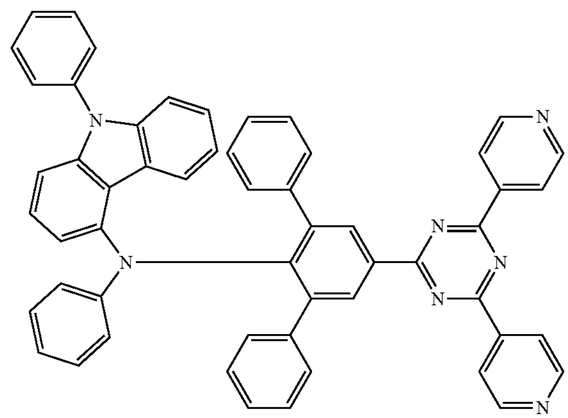
992
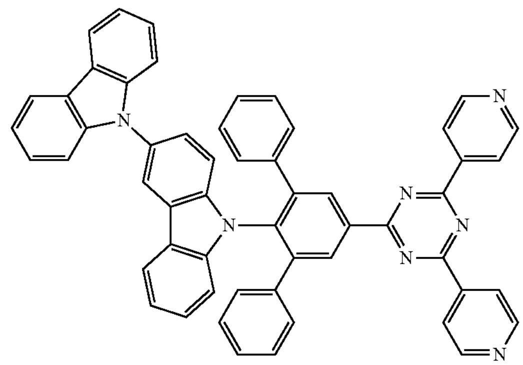

-continued
993
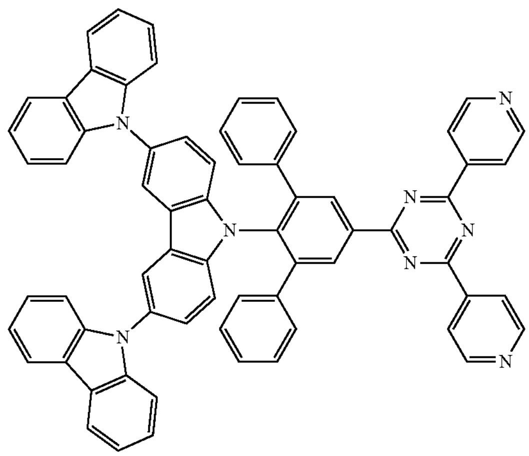
994
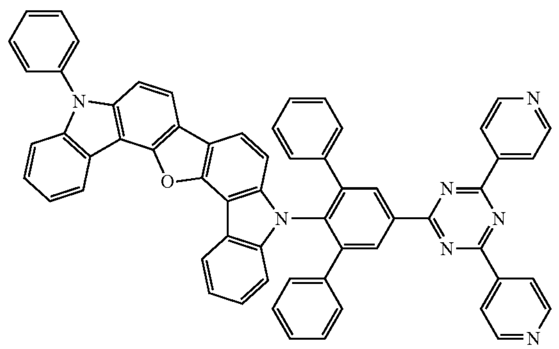
995
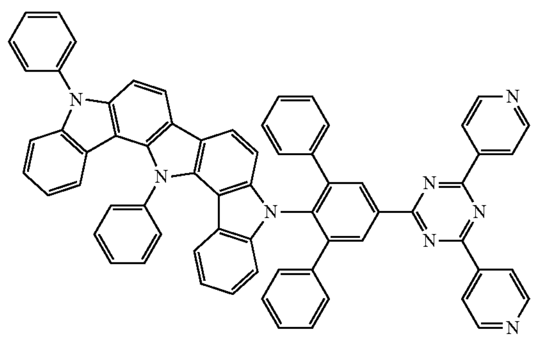
996
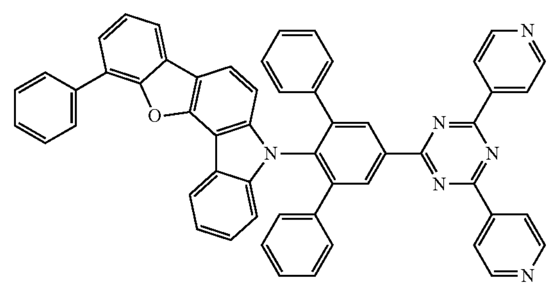
-continued
997
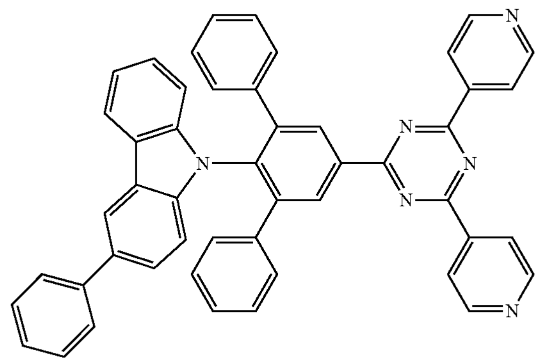
998
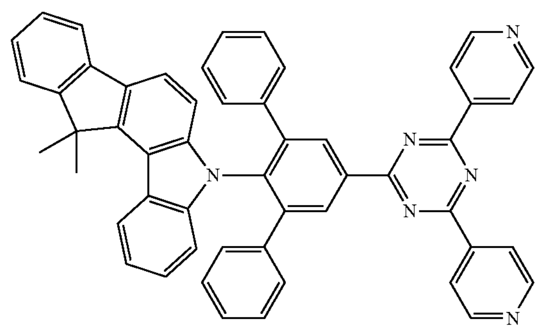
999
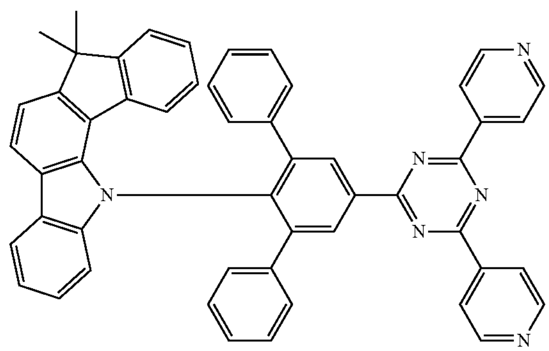
1000
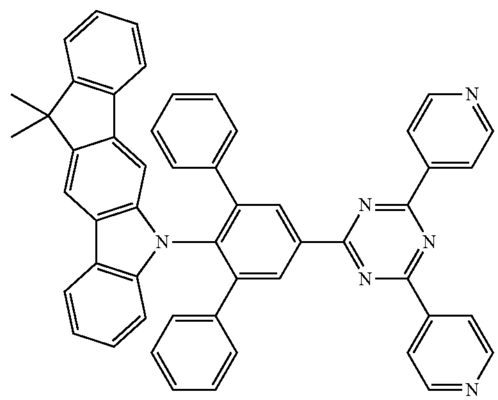

-continued
1001
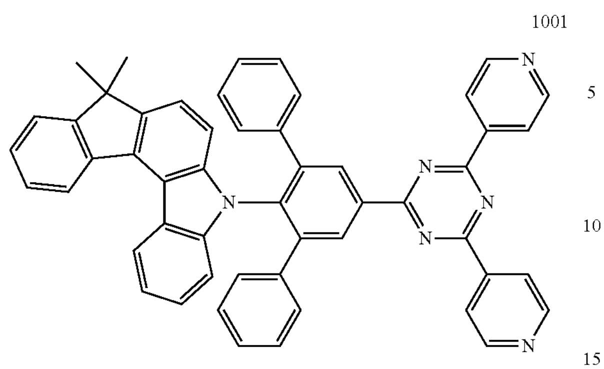
1002
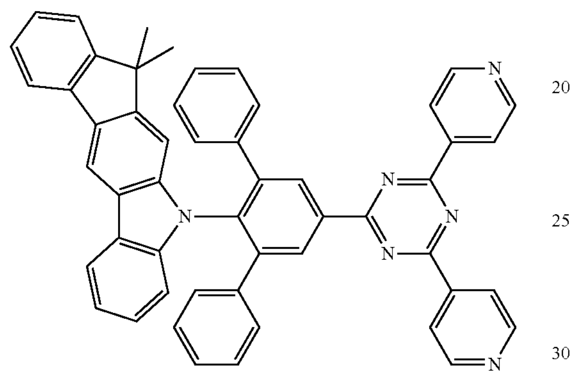
1003
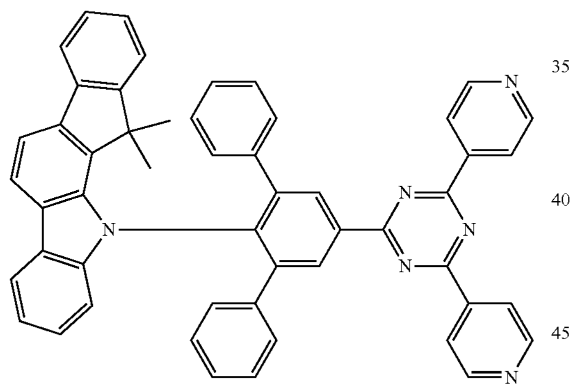
1004
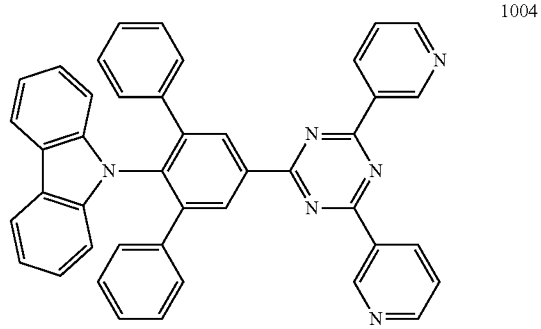
-continued
1005
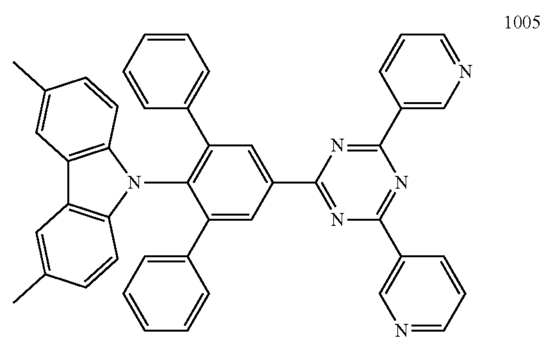
1006
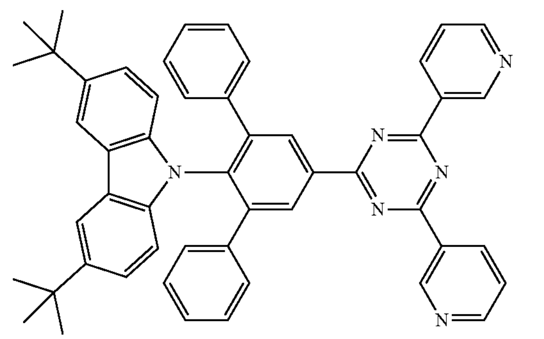
1007
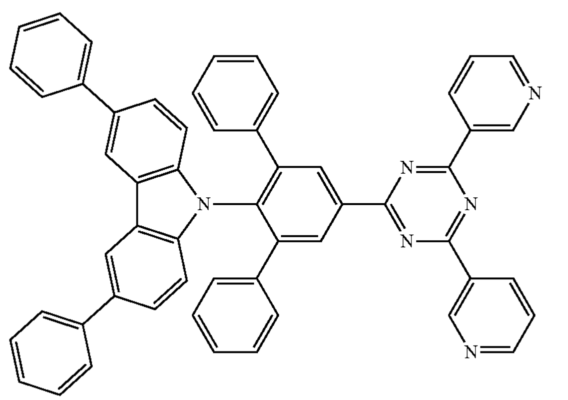
1008
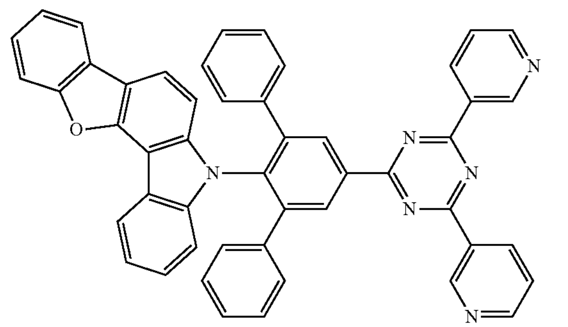

-continued
1009
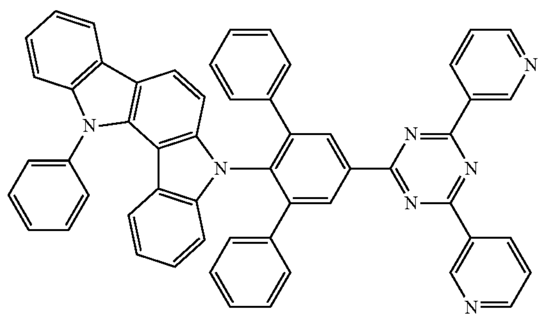
1010
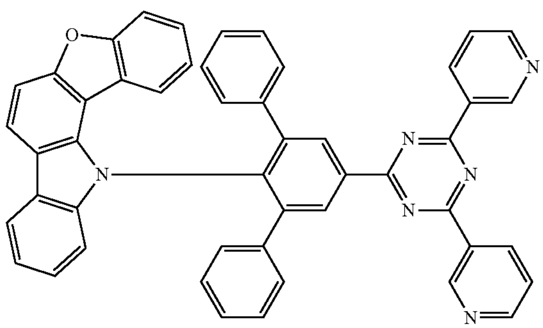
1011
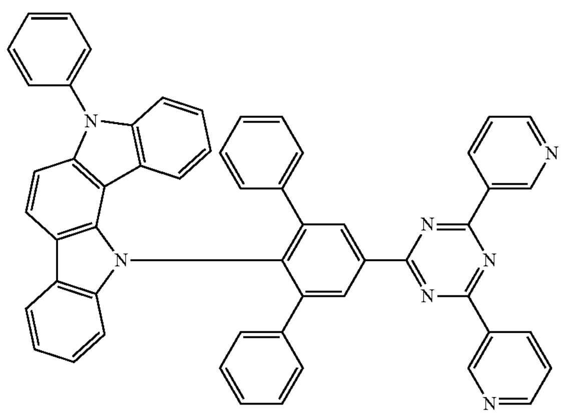
1012
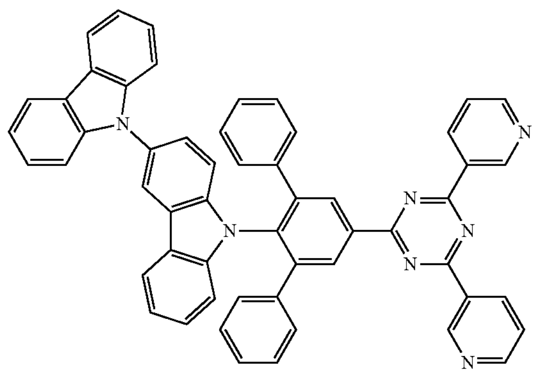
-continued
1013
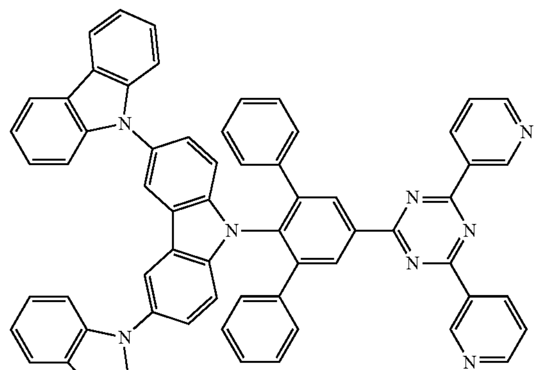
1014
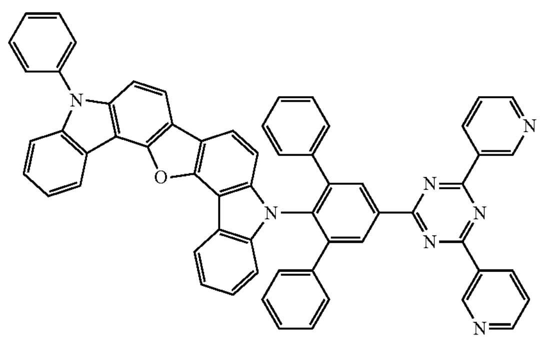
1015
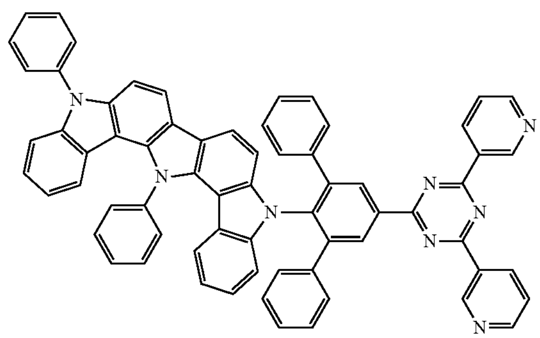
1016
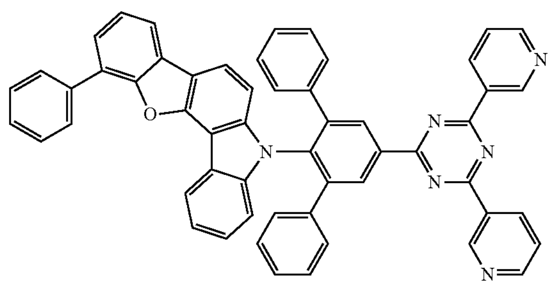

-continued
1017
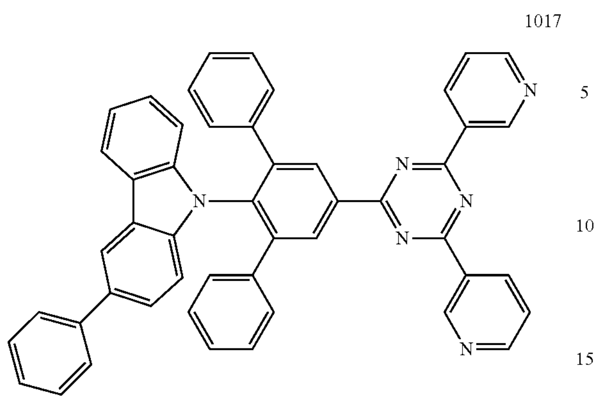
1018
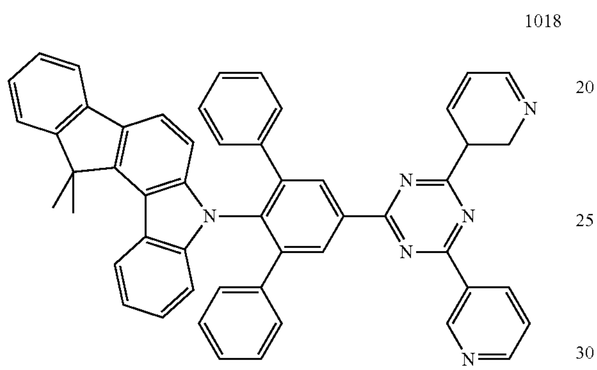
1019
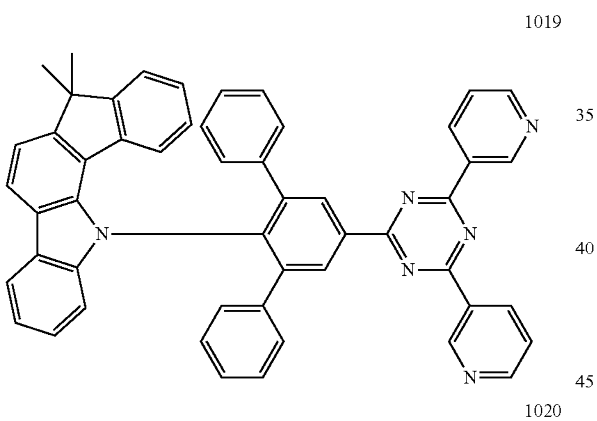
1020
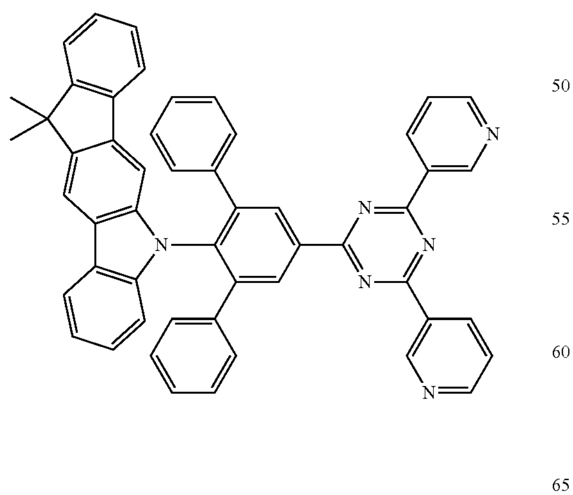
-continued
1021
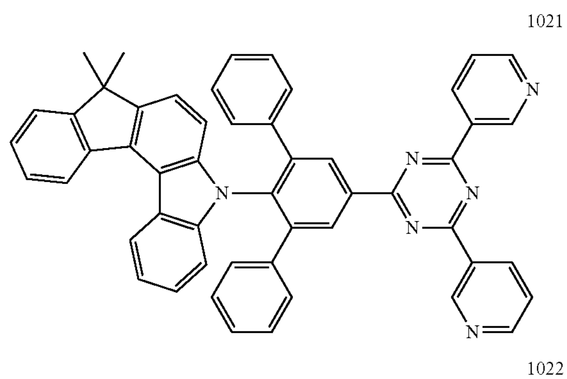
1022
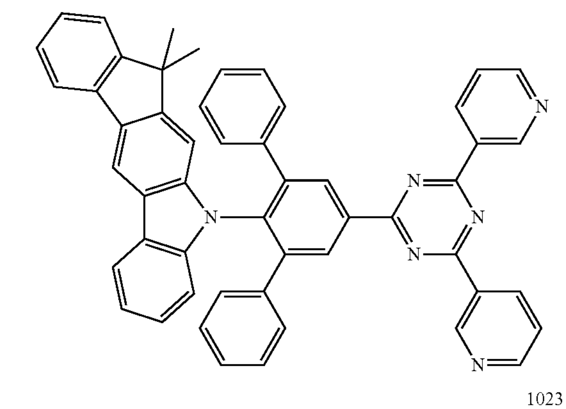
1023
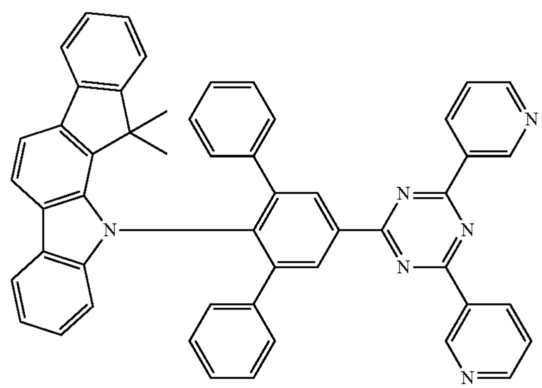
1024
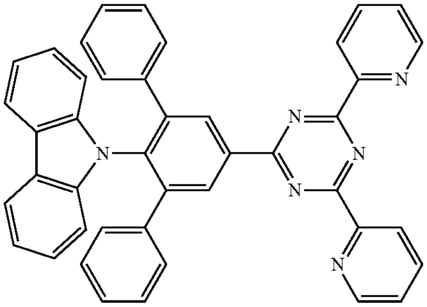

-continued
1025
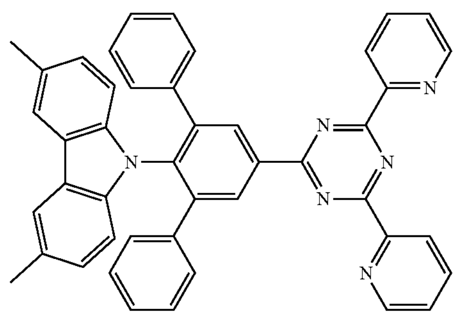
1026
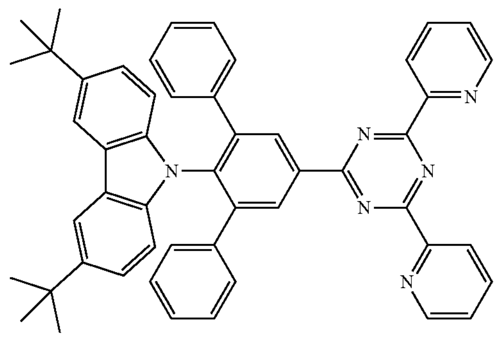
1027
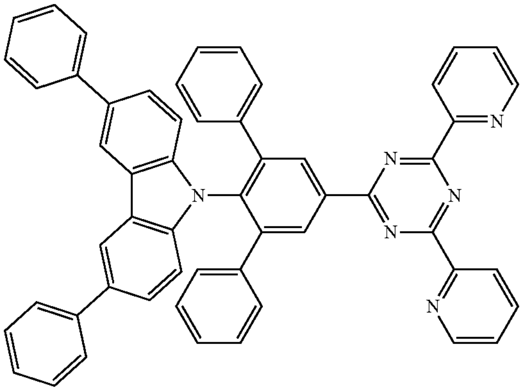
1028
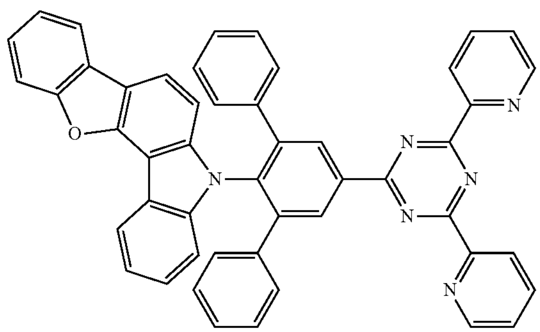
-continued
1029
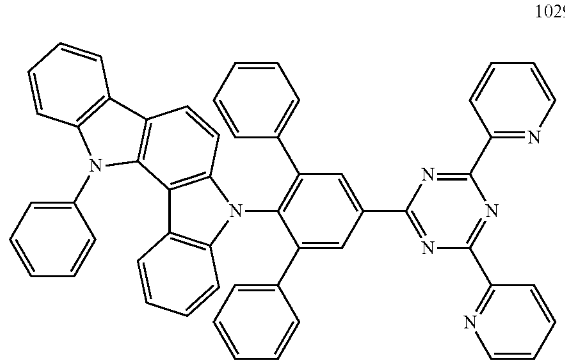
1030
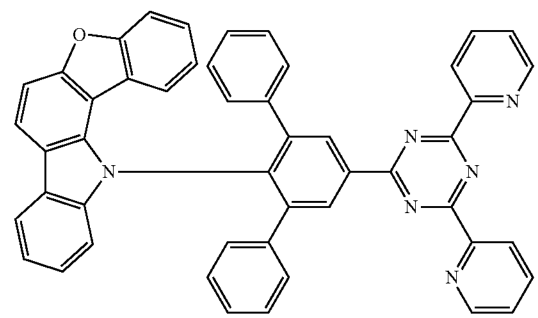
.
Group XIV
1
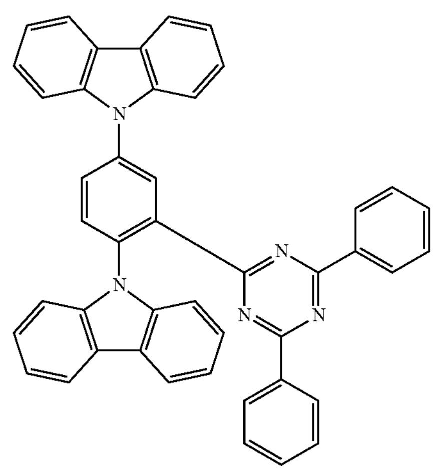

-continued
2
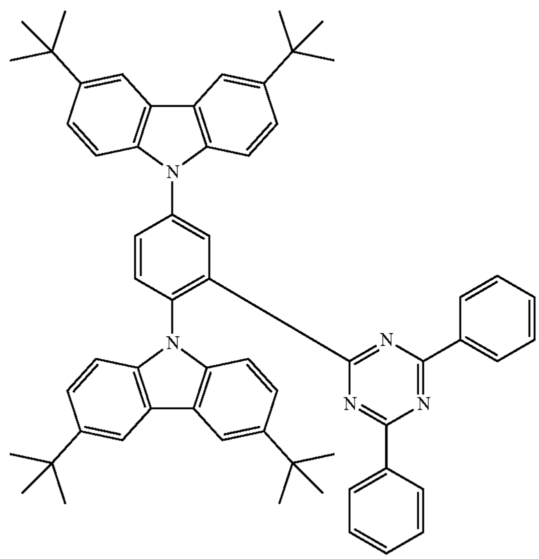
3
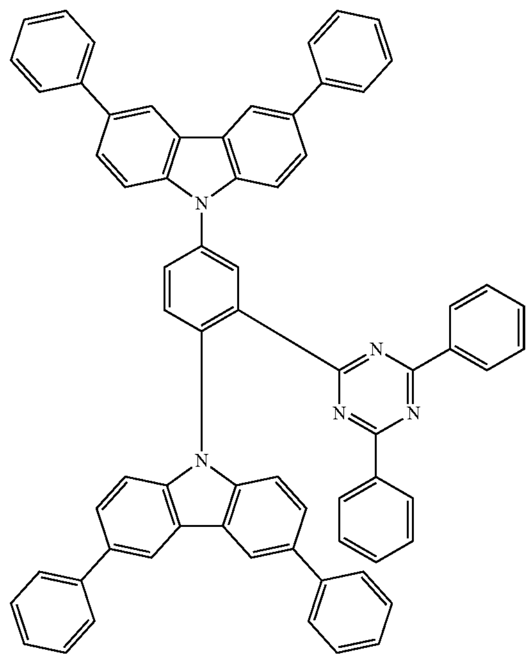
-continued
4
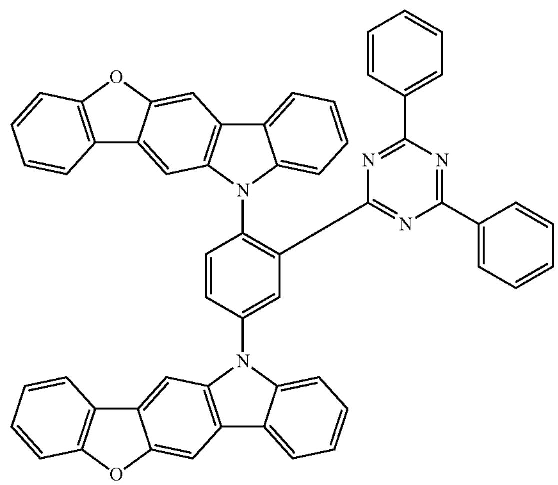
5
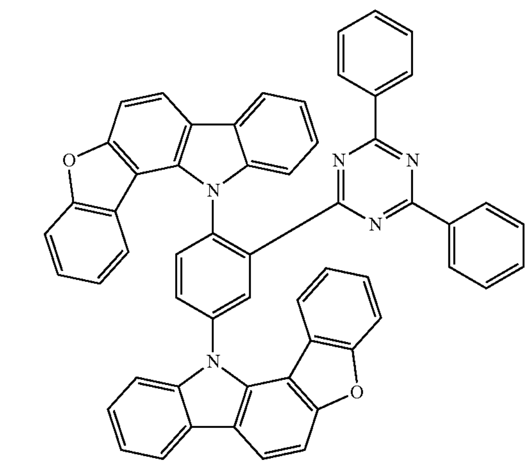
6
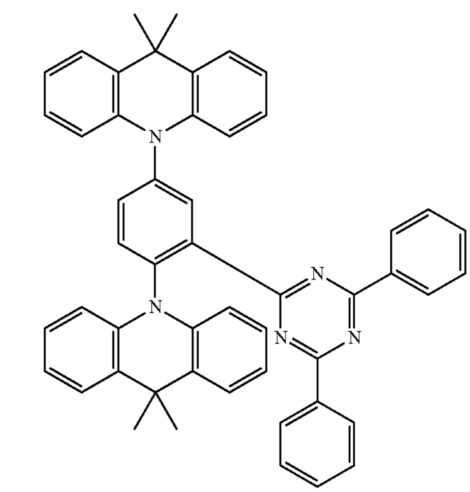

-continued
7
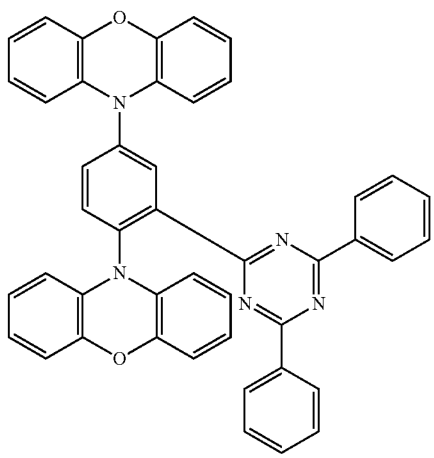
8
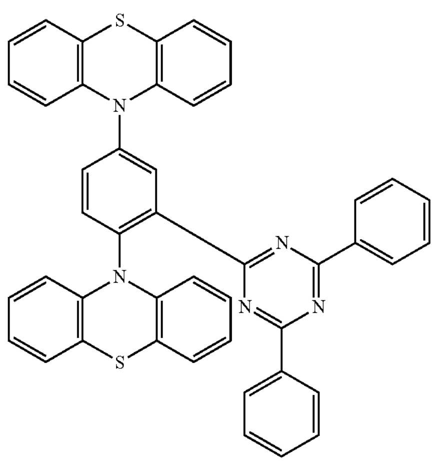
9
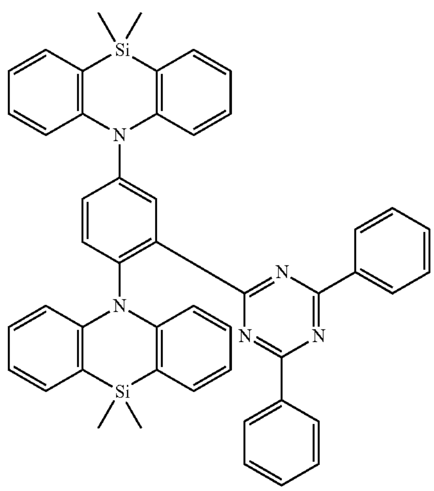
10
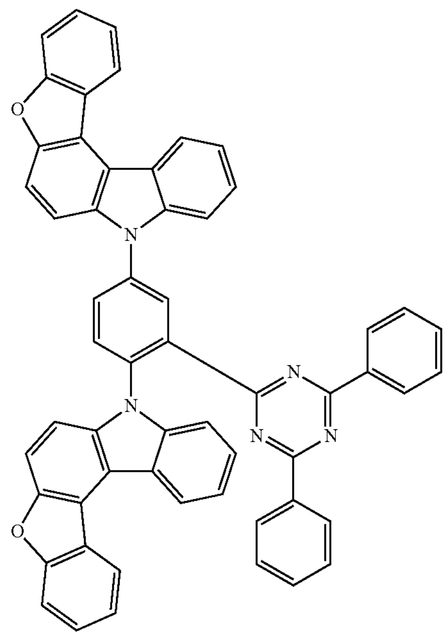
11
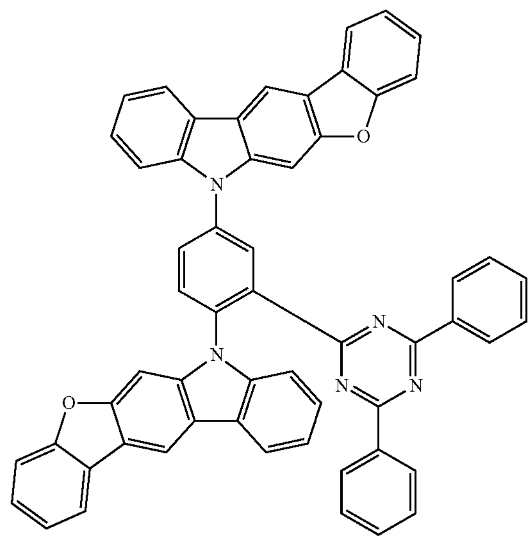
12
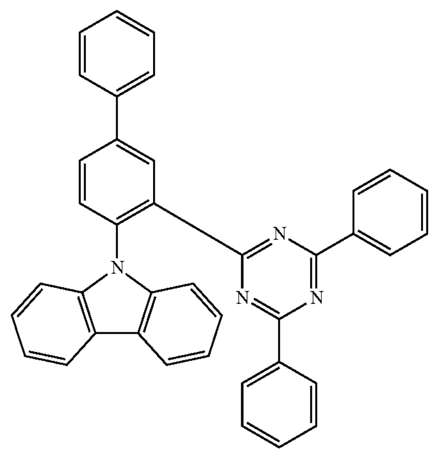

-continued
13
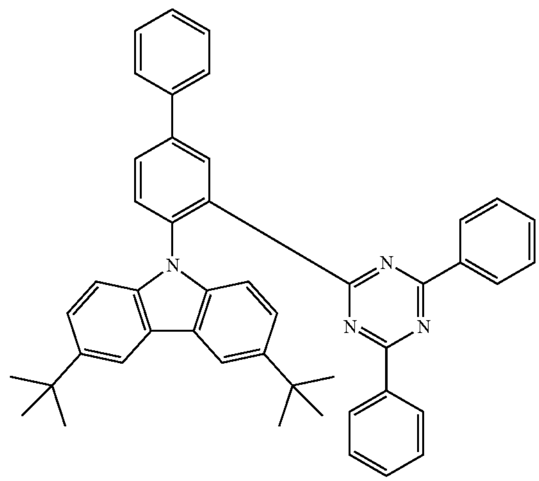
14
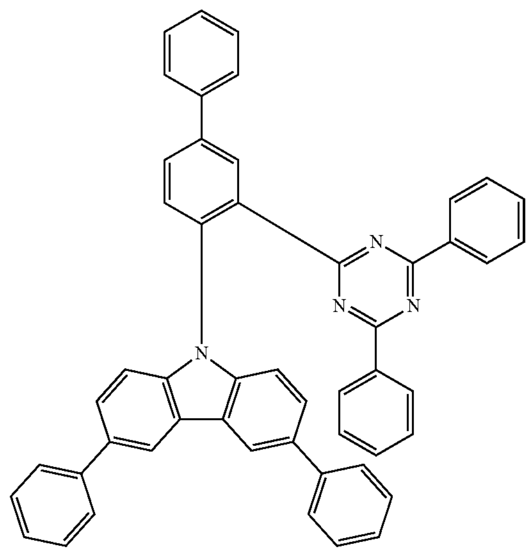
15
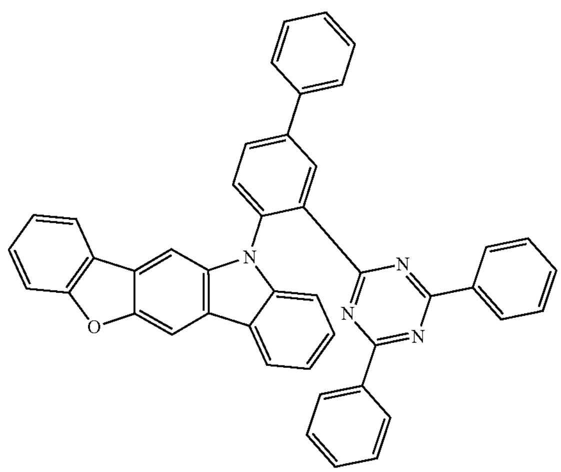
-continued
16
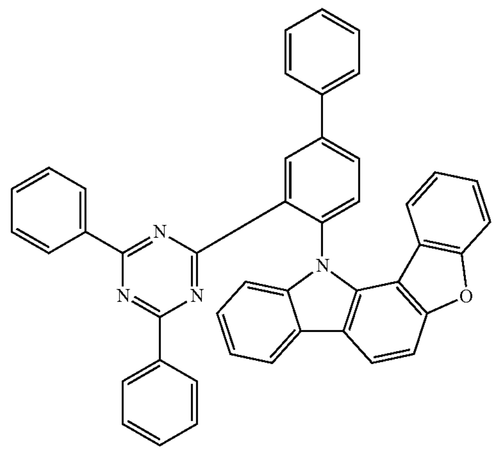
17
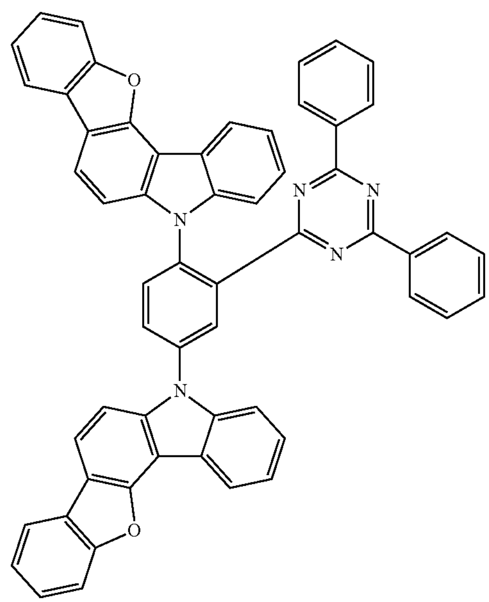
18
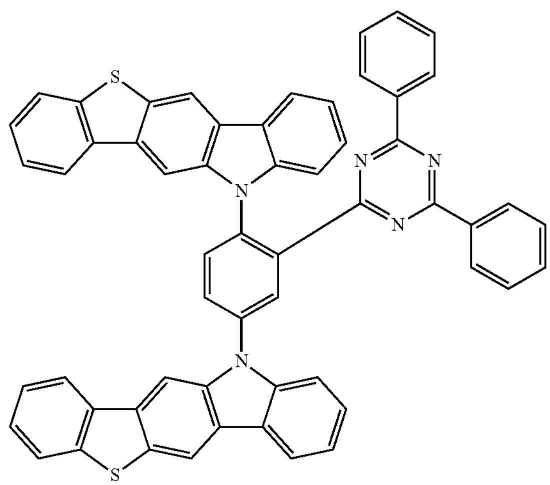

-continued
19
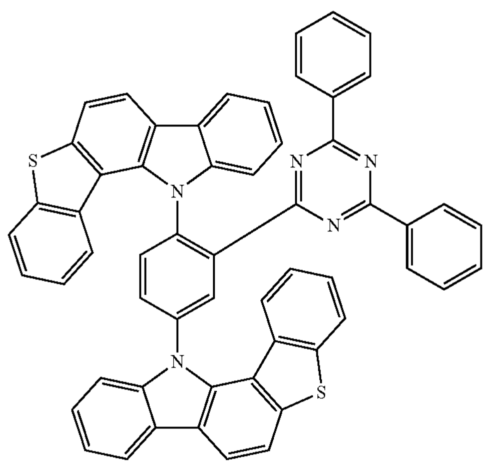
20
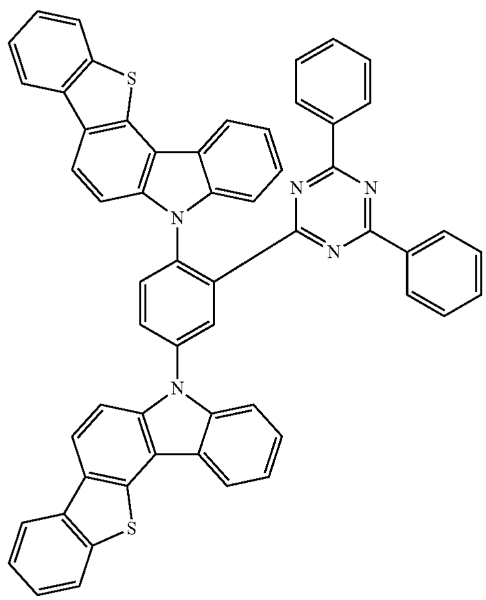
21
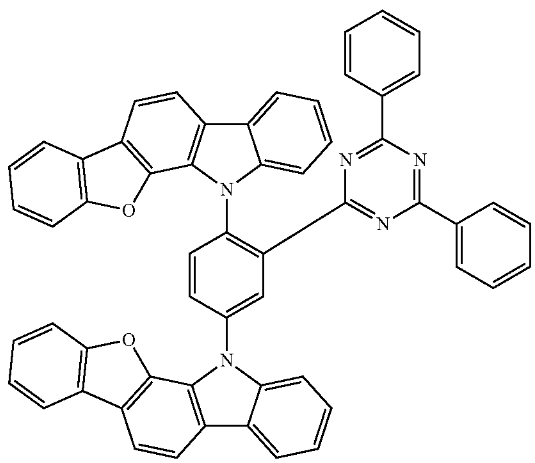
-continued
22
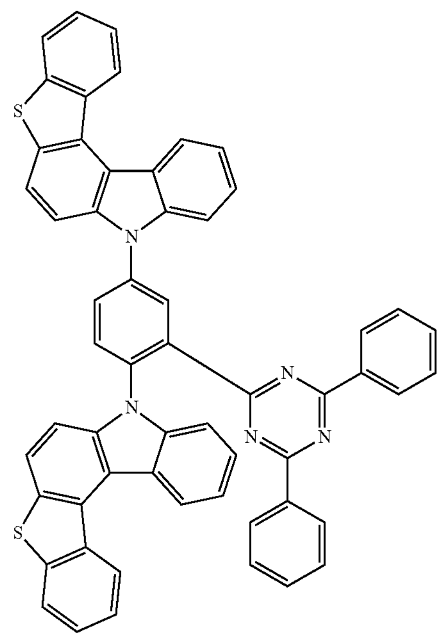
23
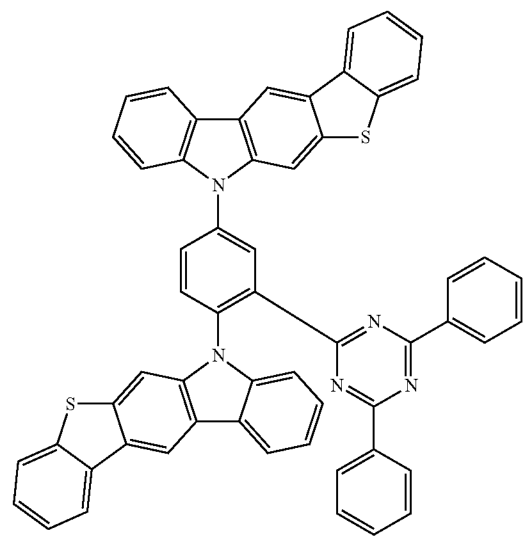
24
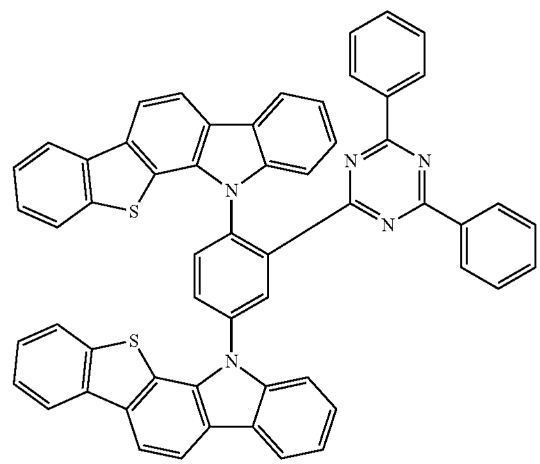

-continued
25
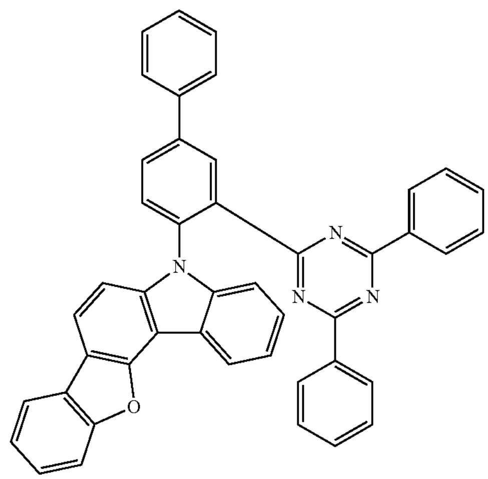
26
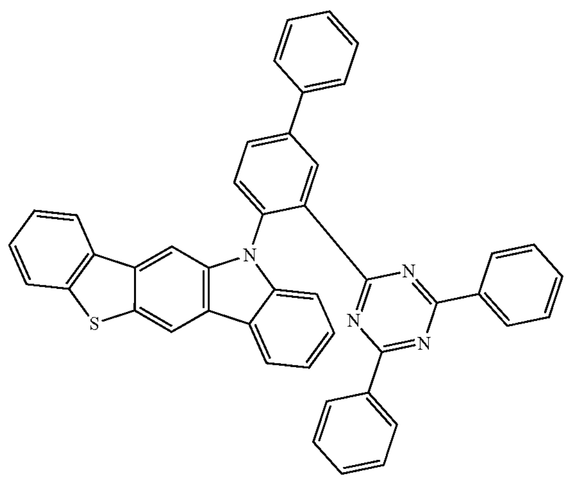
27
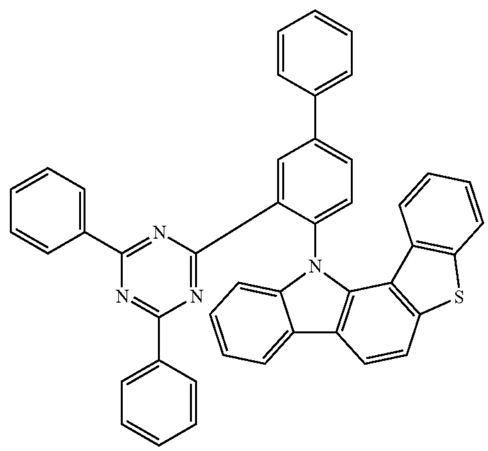
-continued
28
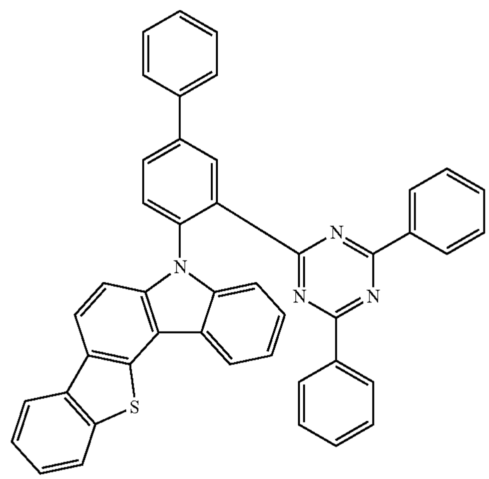
29
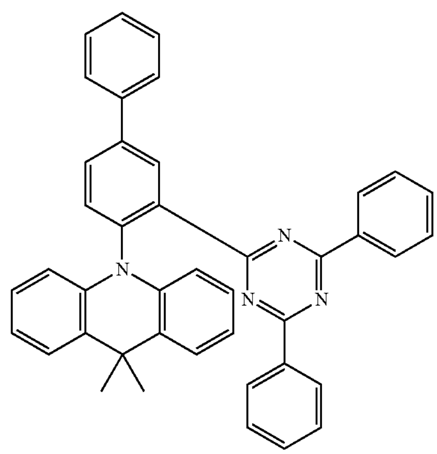
30
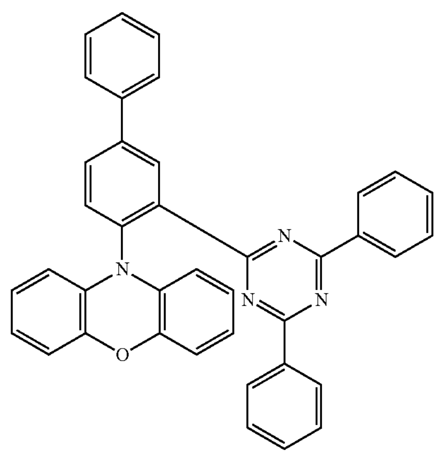

-continued
31
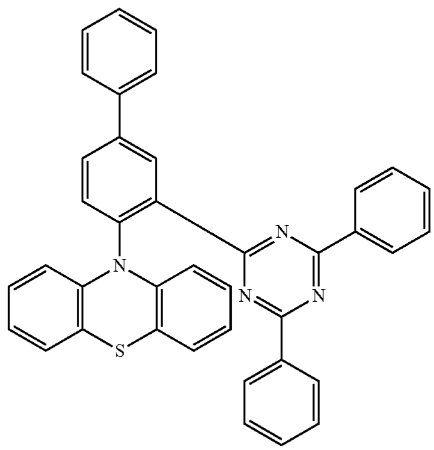
32
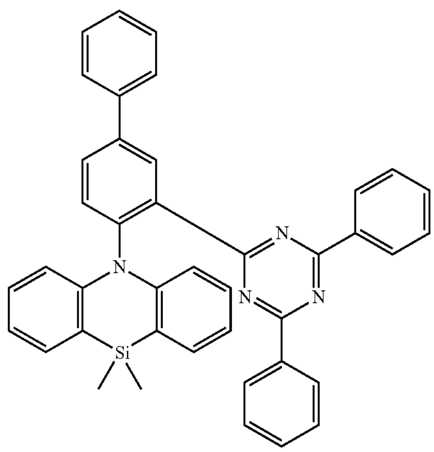
33
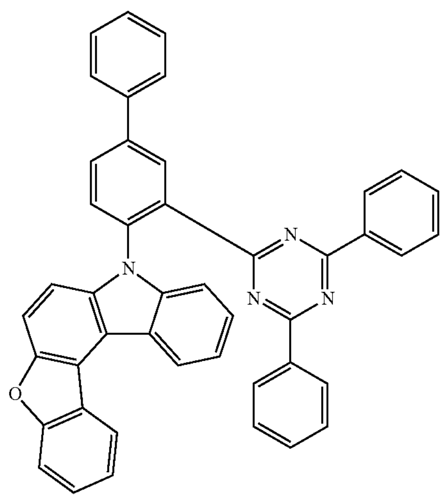
-continued
34
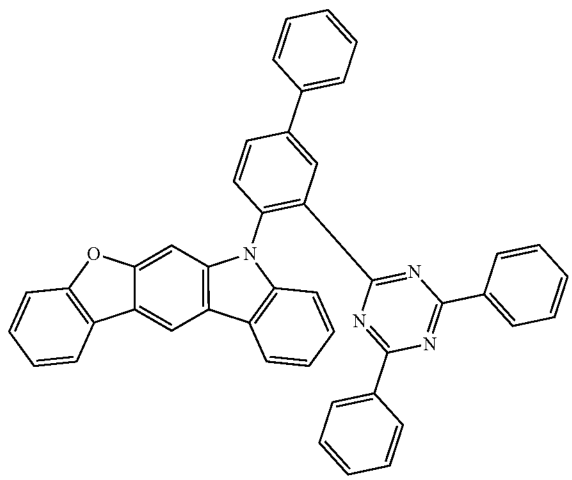
35
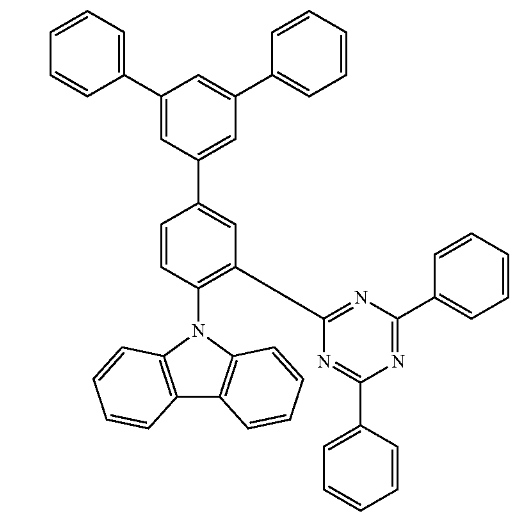
36
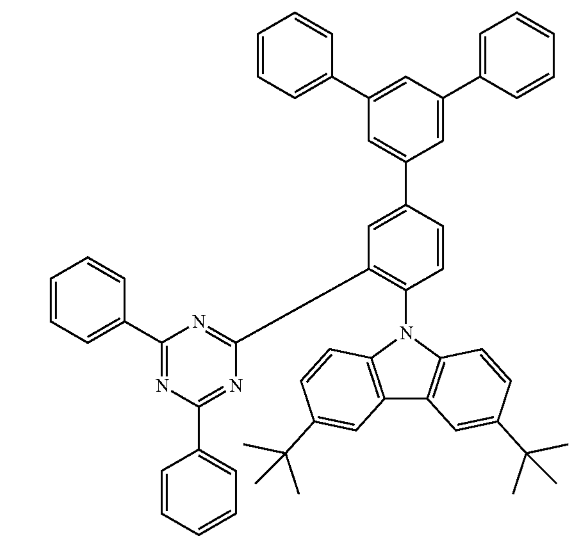

-continued
37
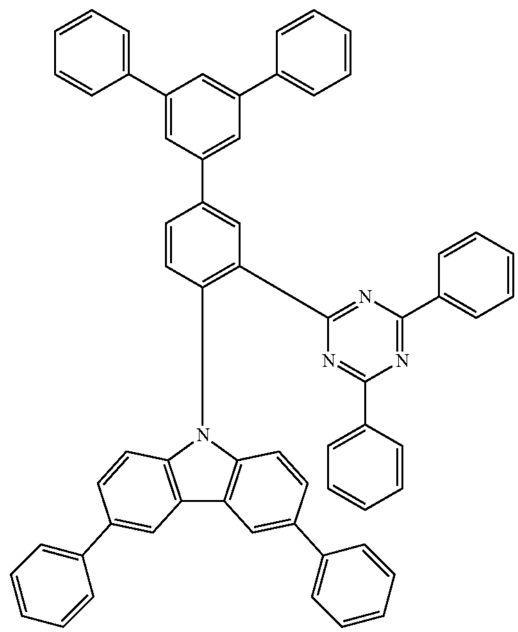
38
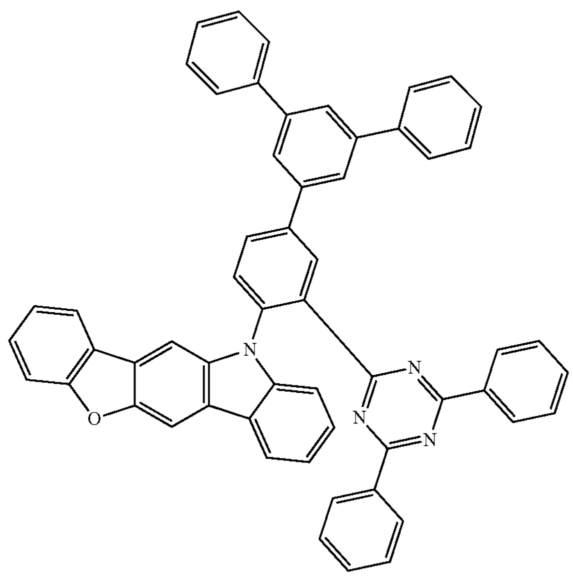
-continued
39
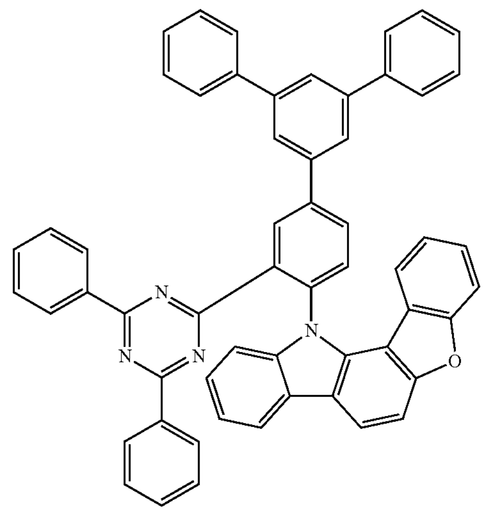
40
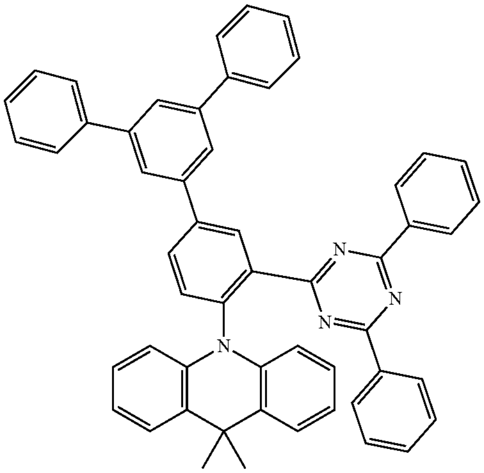
41
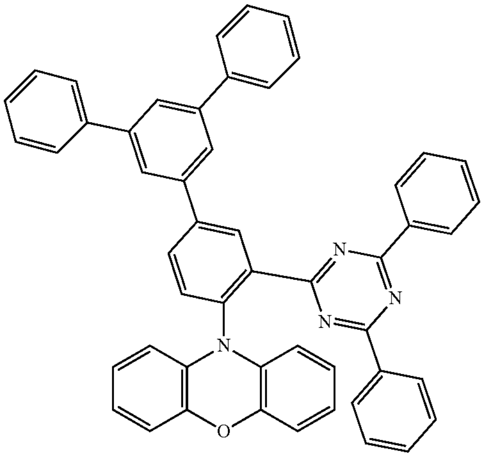

-continued
42
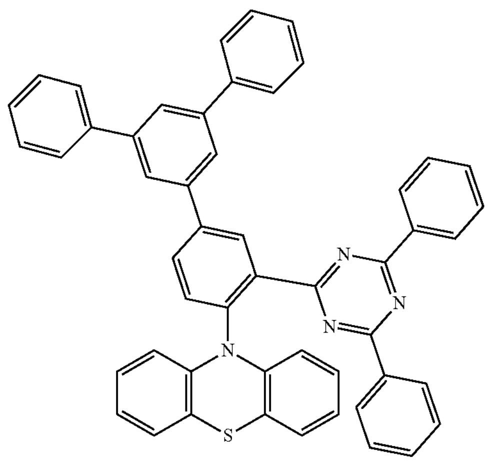
43
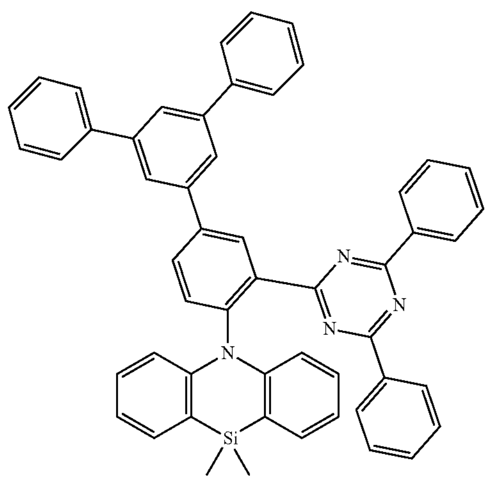
44
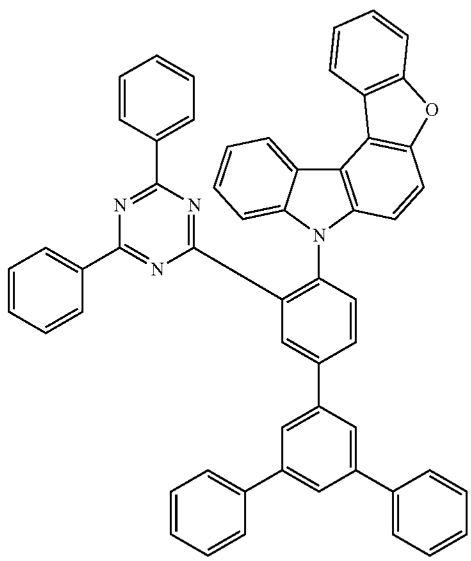
-continued
45
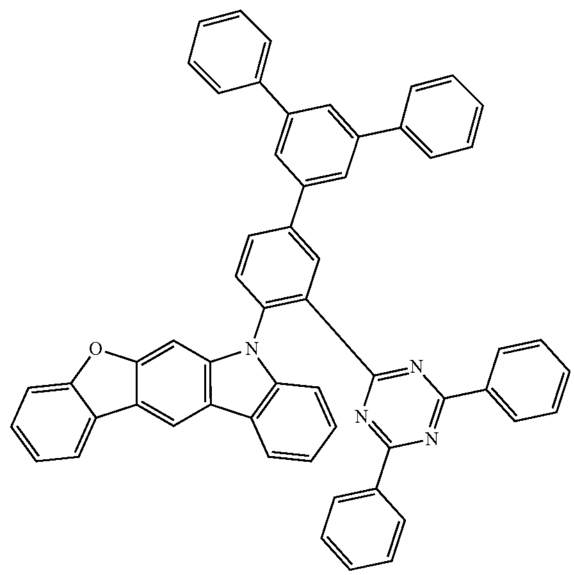
46
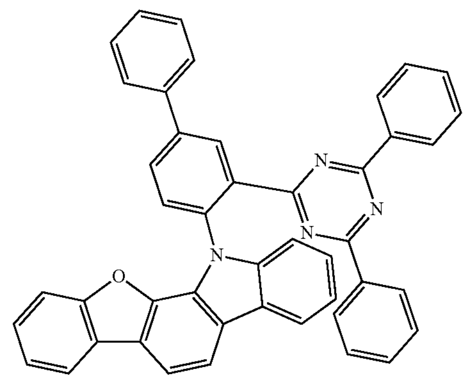
47
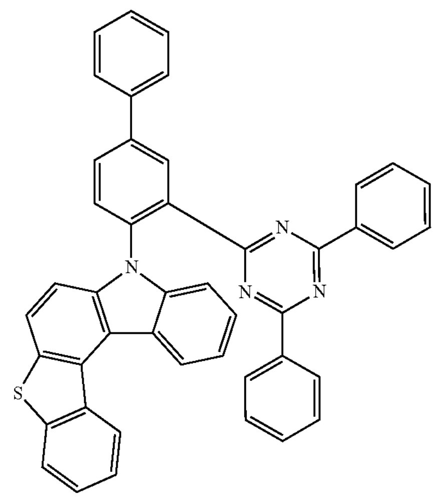

-continued
48
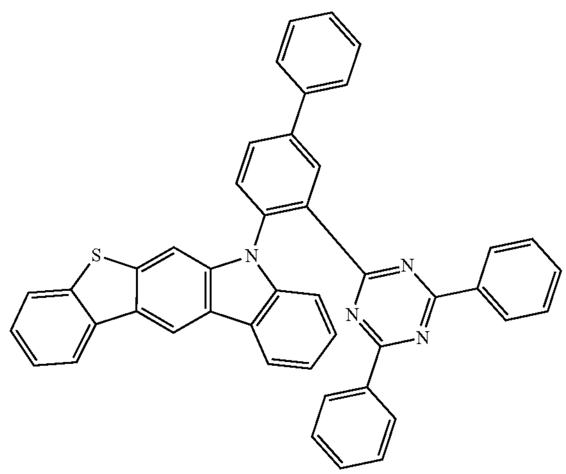
49
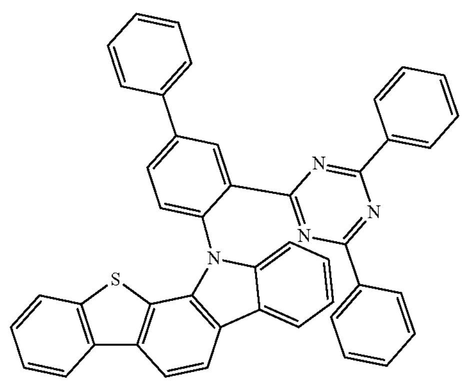
50
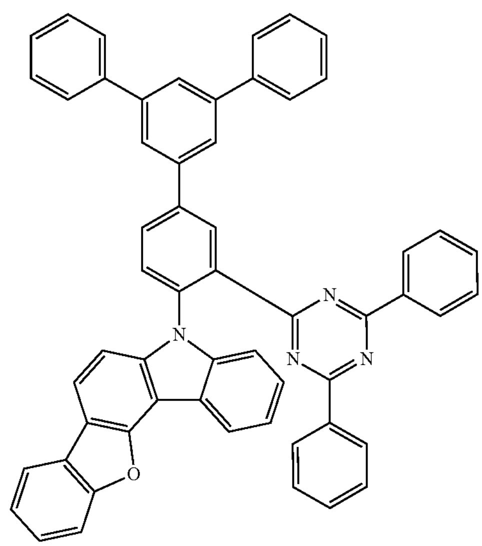
-continued
51
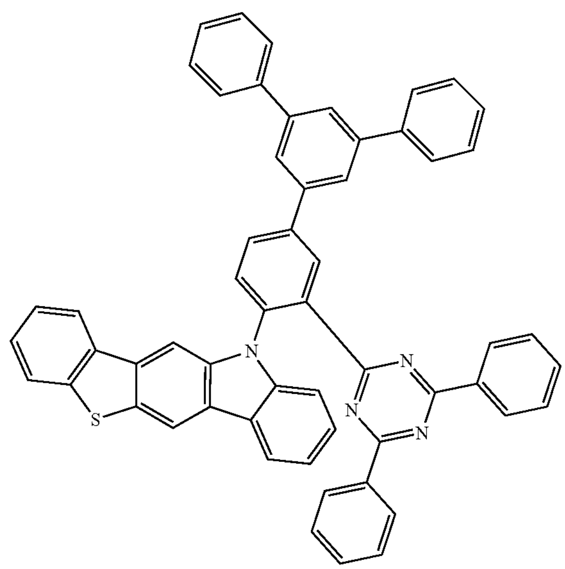
52
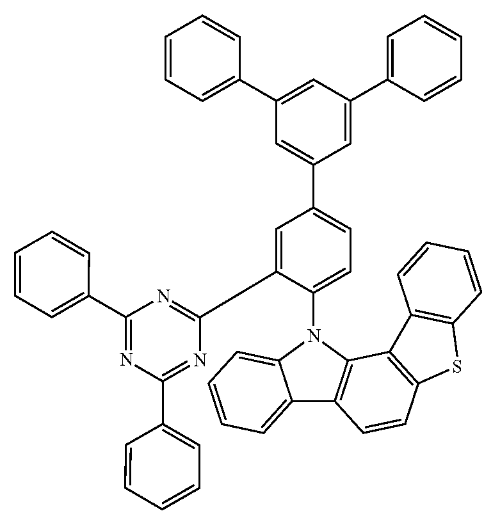
53
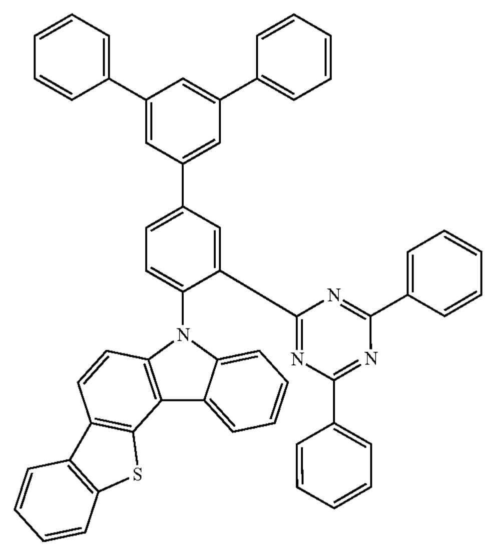

-continued
54
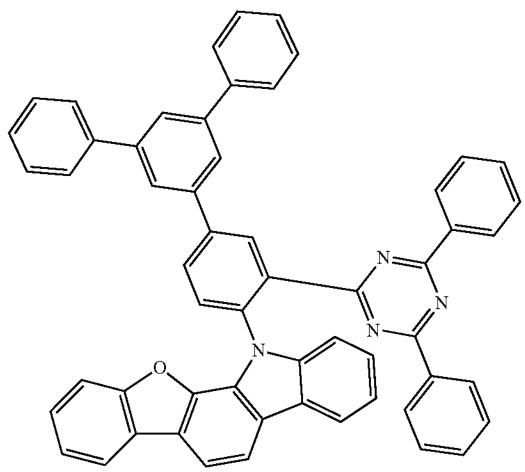
55
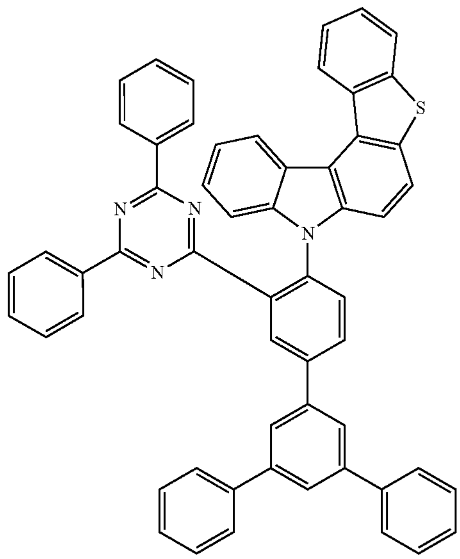
56
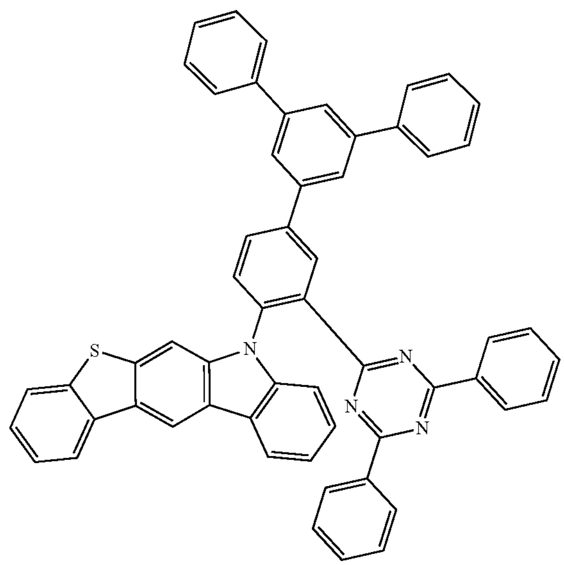
-continued
57
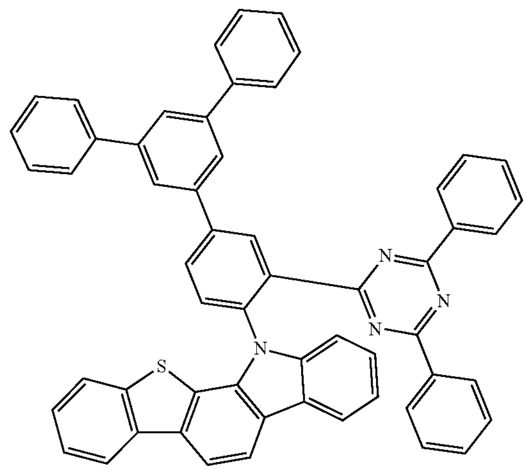
58
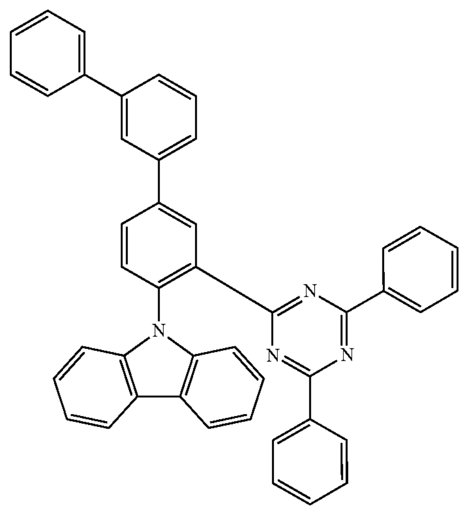
59
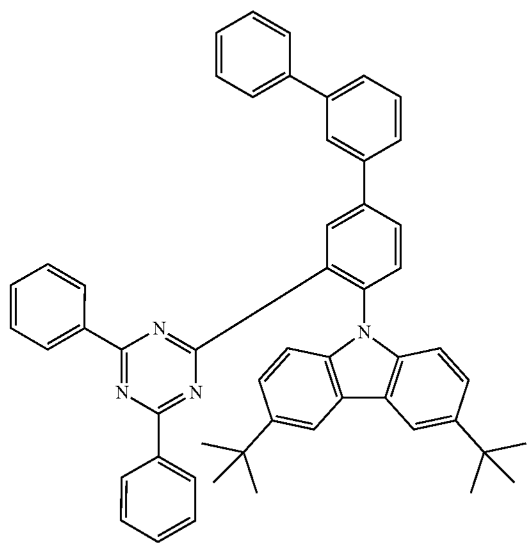

-continued
60
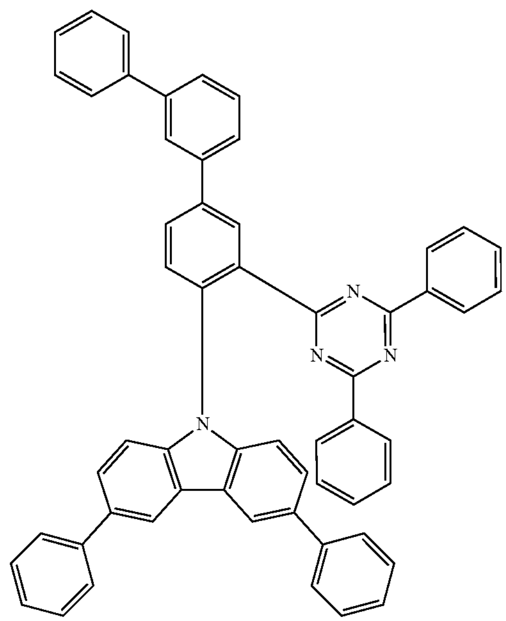
61
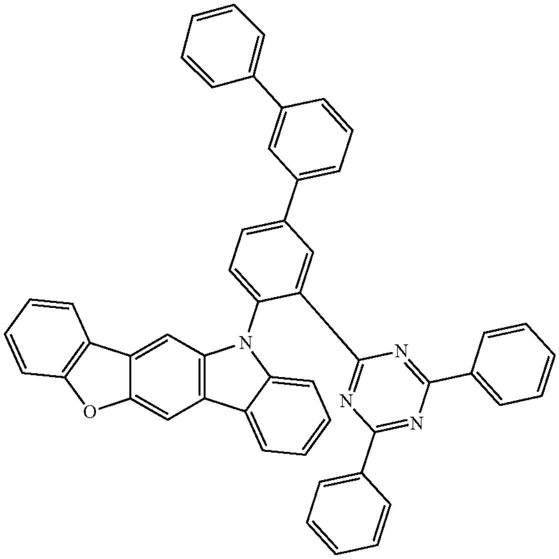
-continued
62
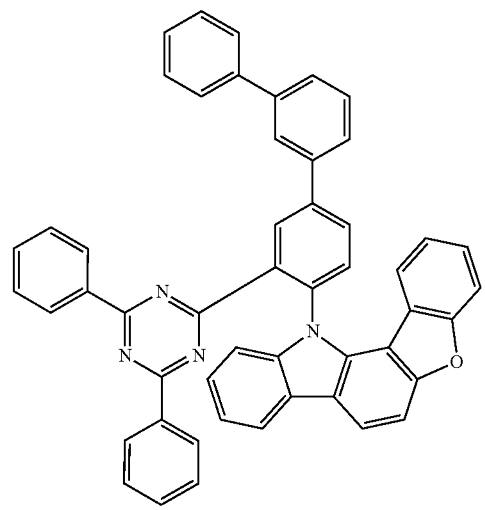
63
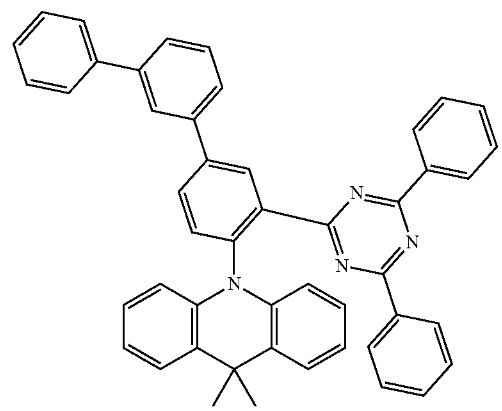
64
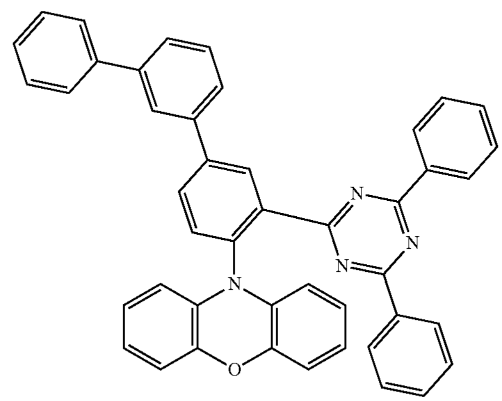

65
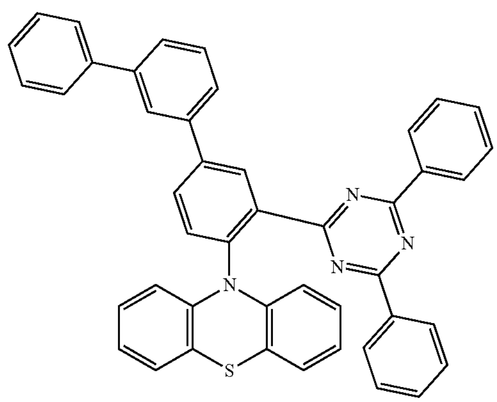
66
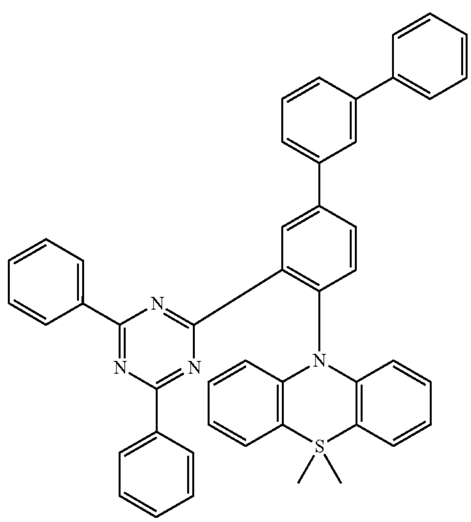
67
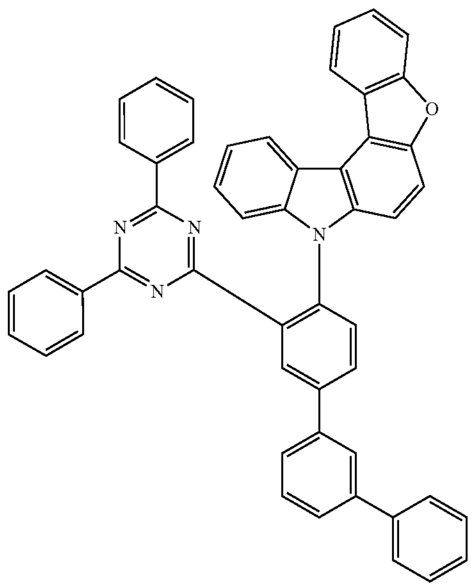
68
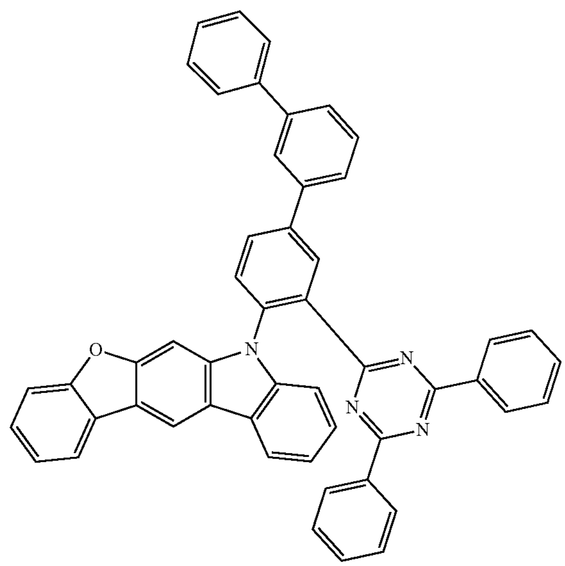
69
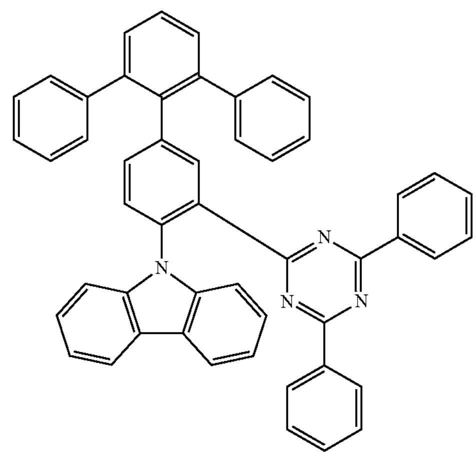
70
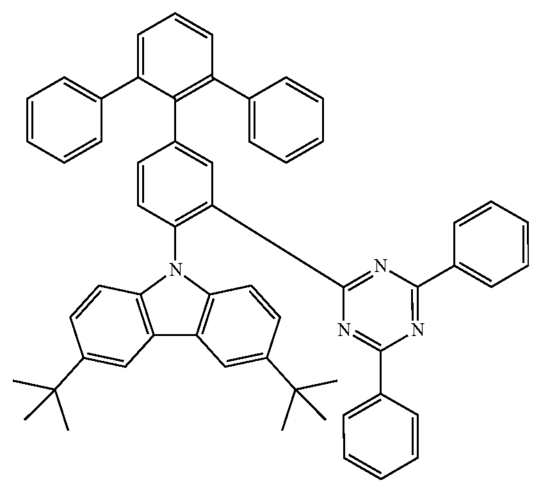

-continued
71
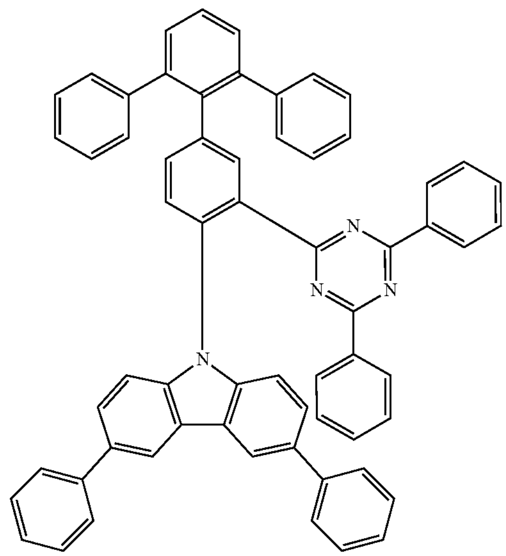
72
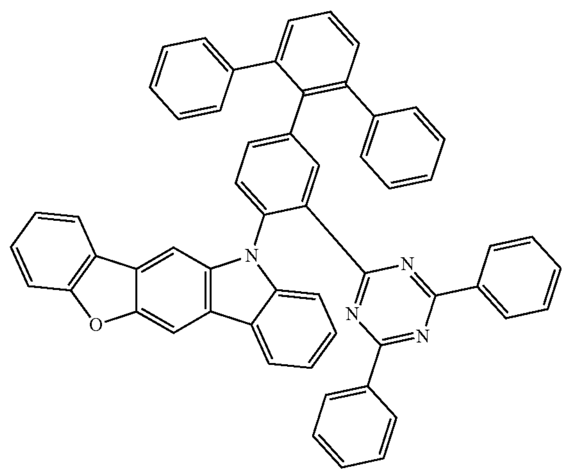
73
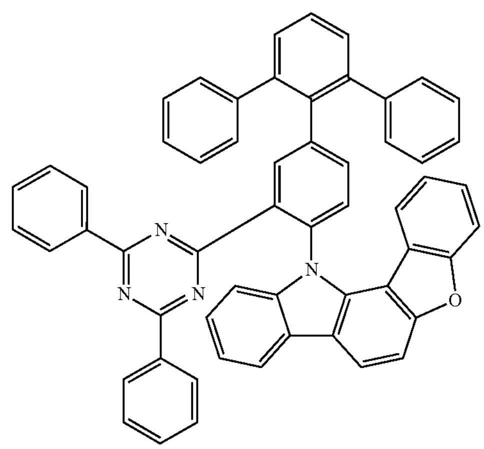
-continued
74
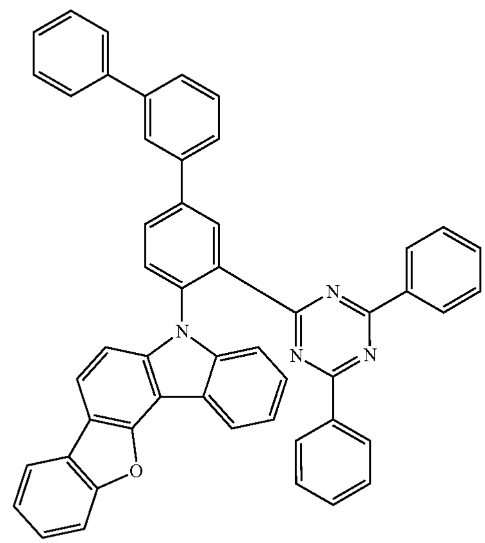
75
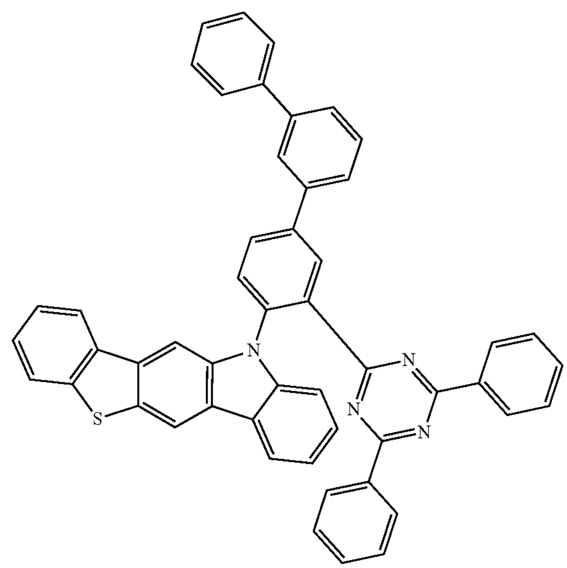
76
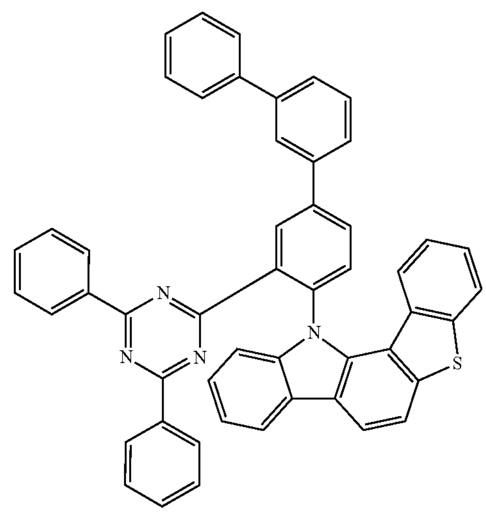

77
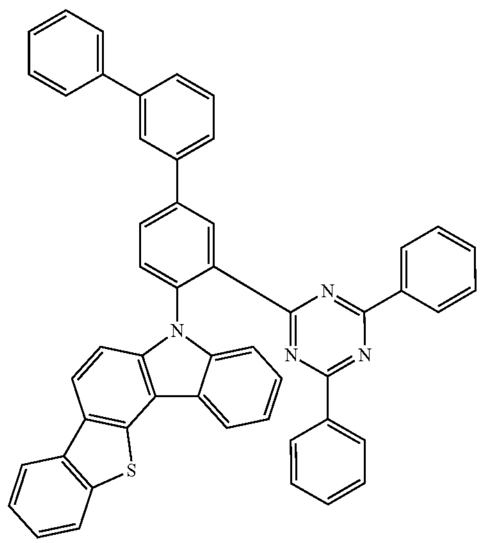
78
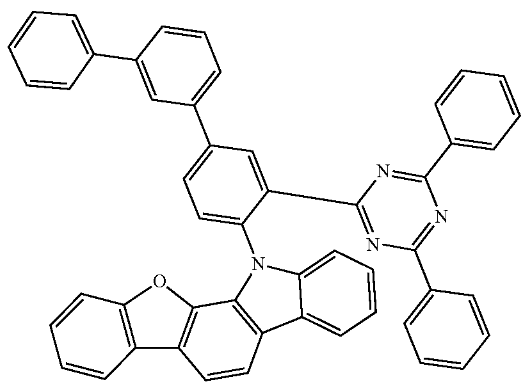
79
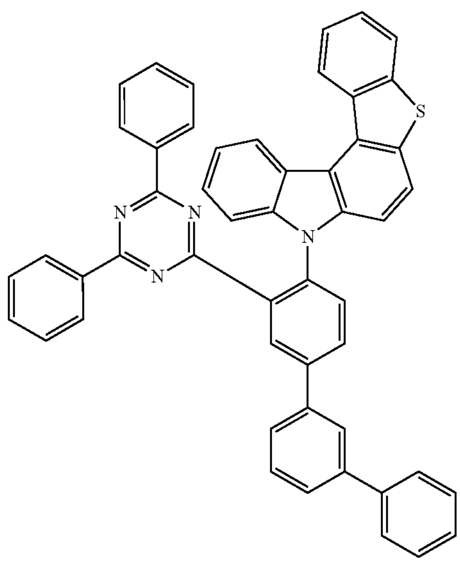
80
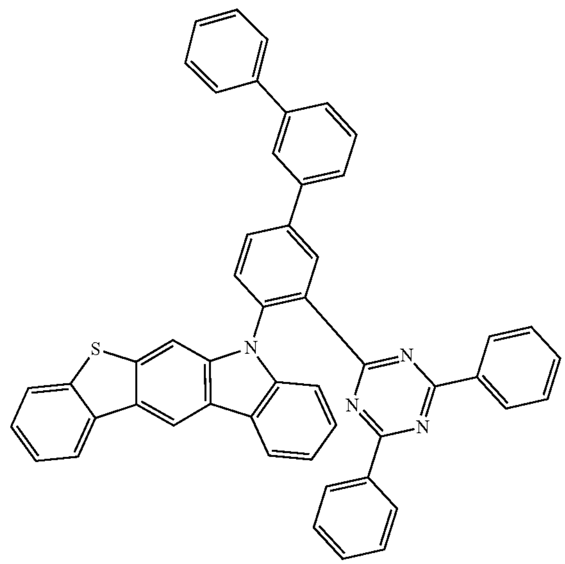
81
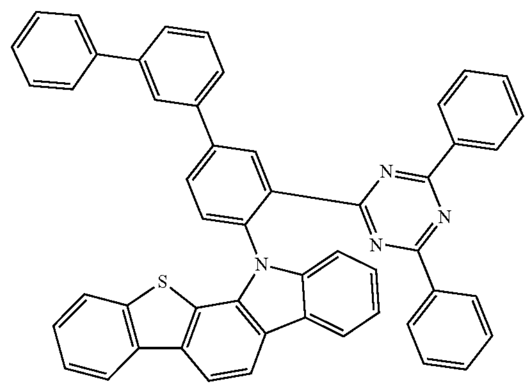
82
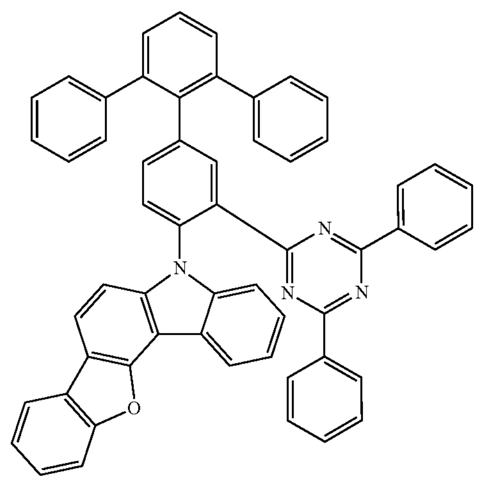

-continued
83
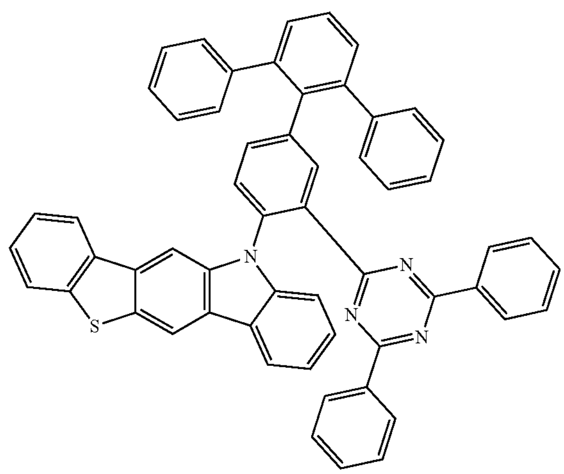
84
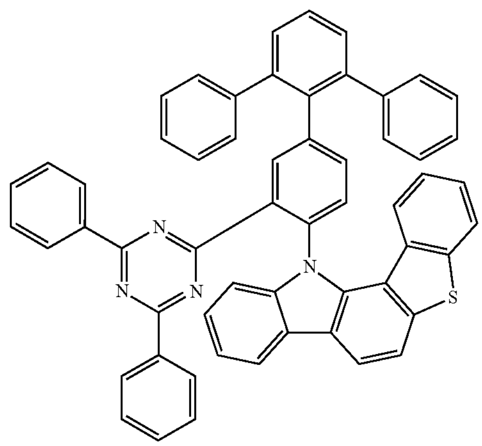
85
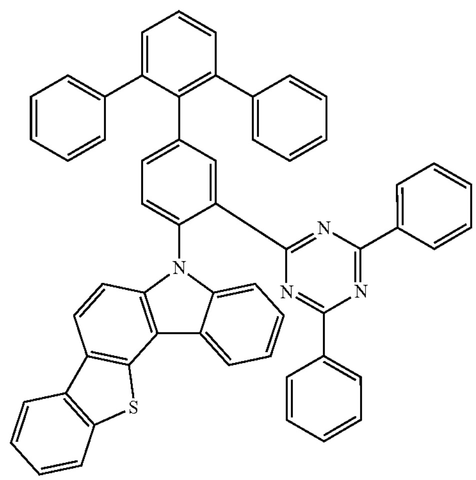
-continued
86
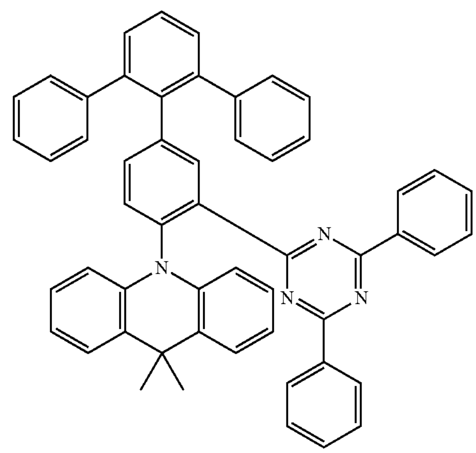
87
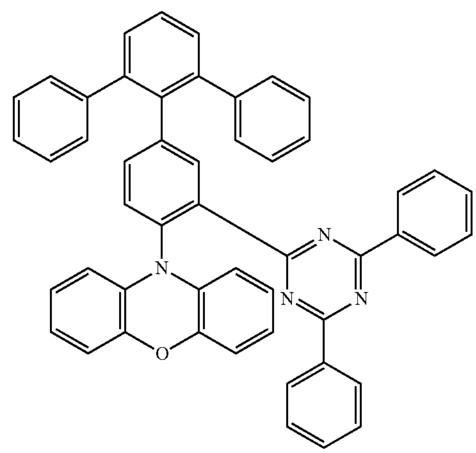
88
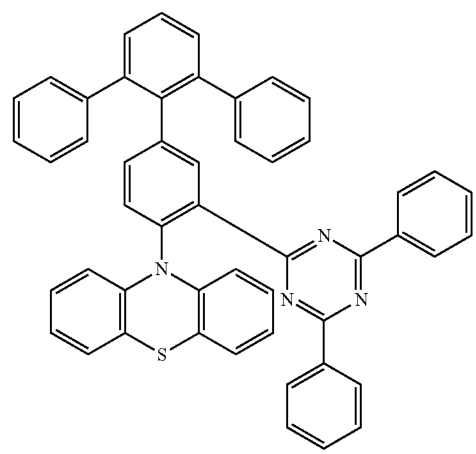

-continued
89
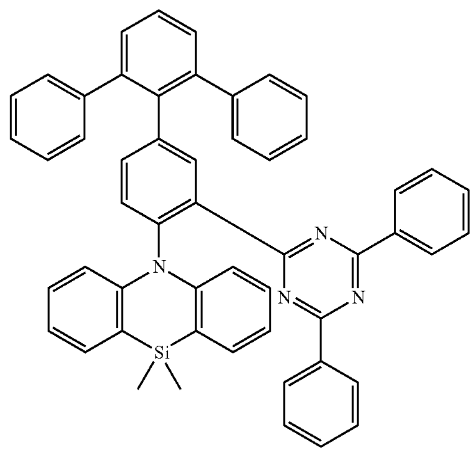
90
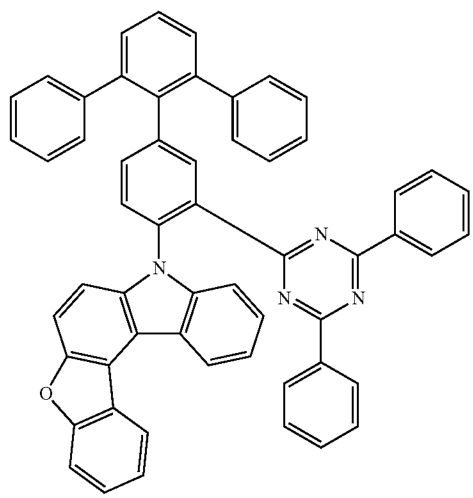
91
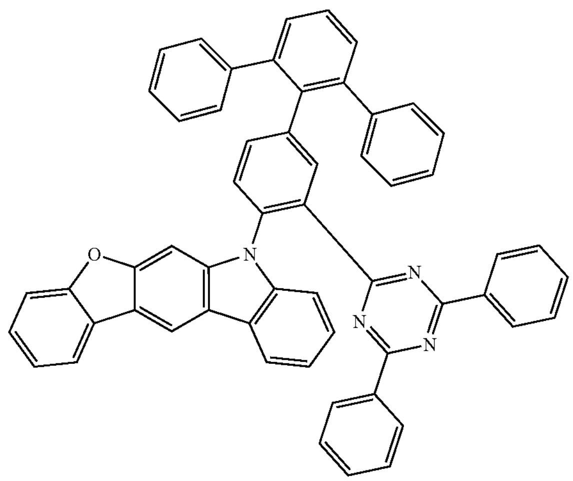
92
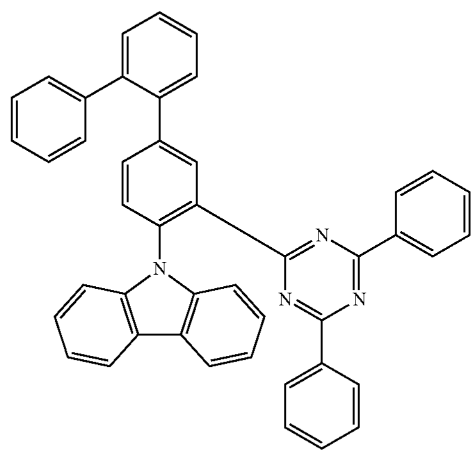
93
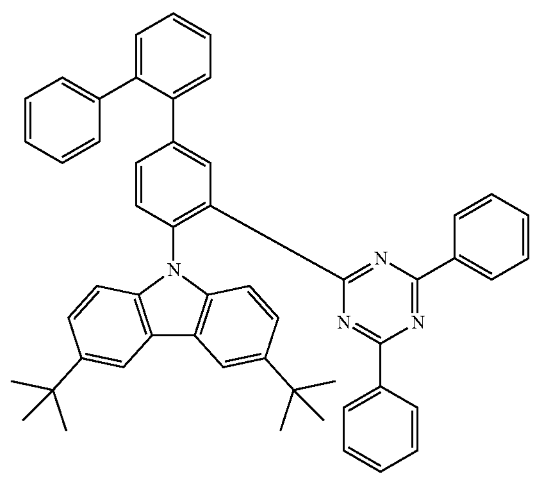
94
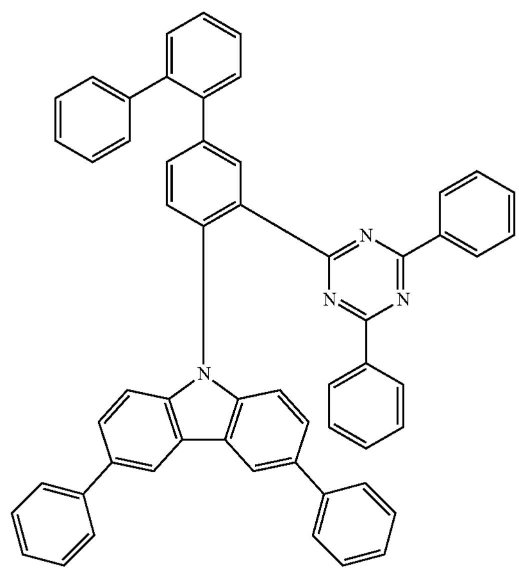

-continued
95
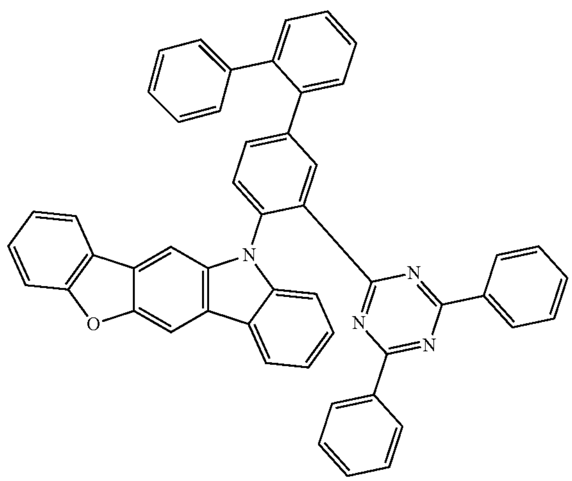
96
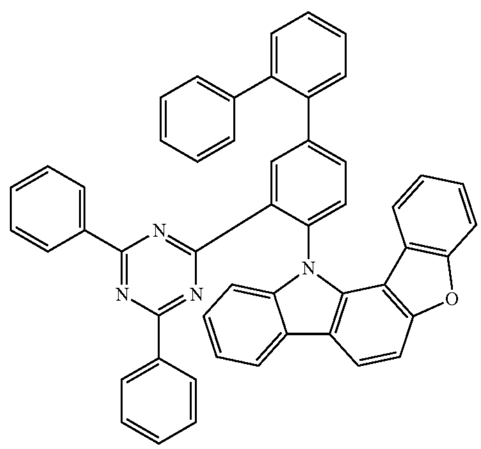
97
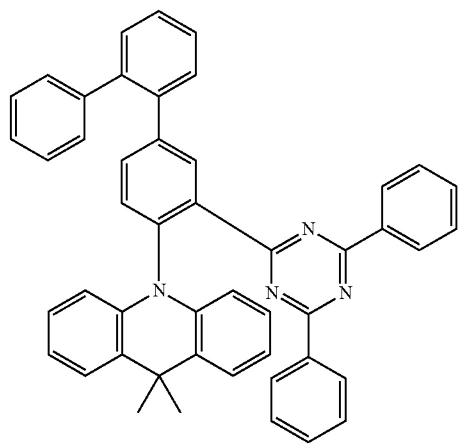
-continued
98
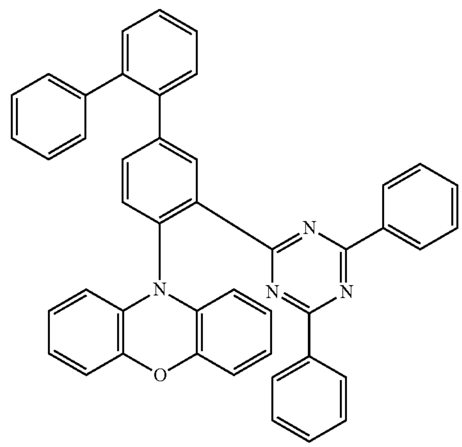
99
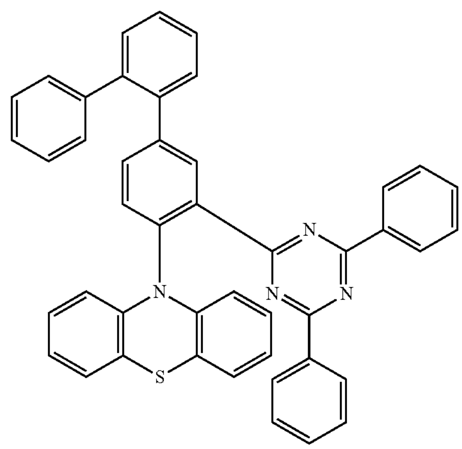
100
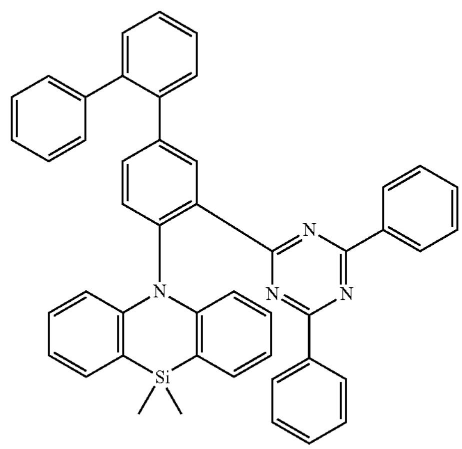

-continued
101
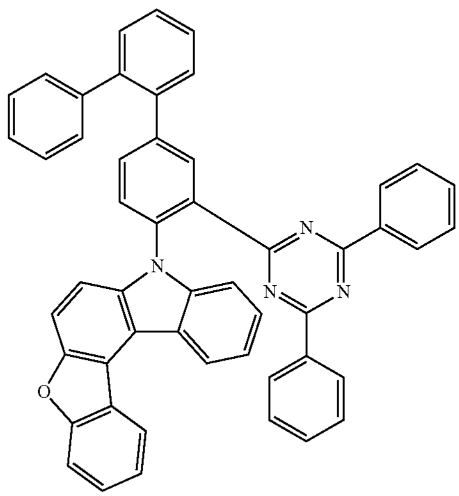
102
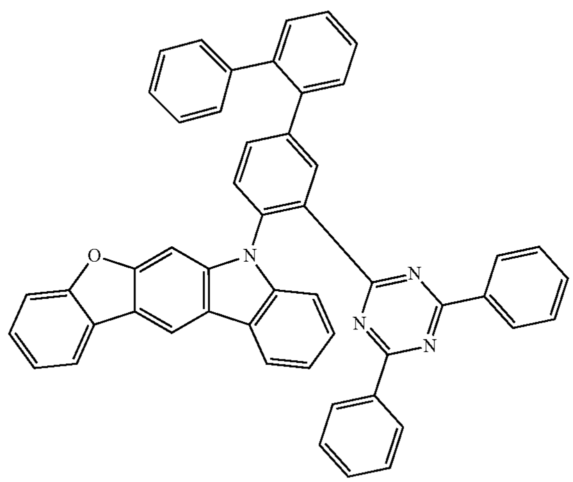
103
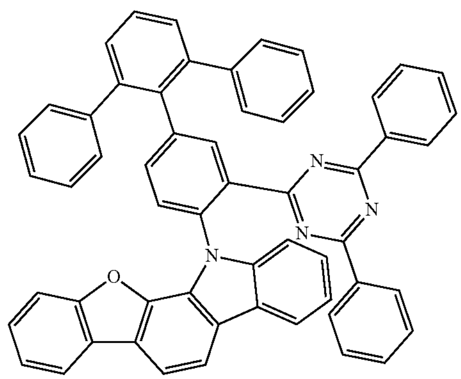
-continued
104
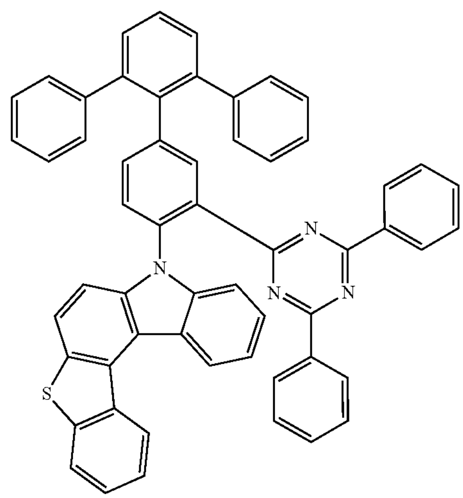
105
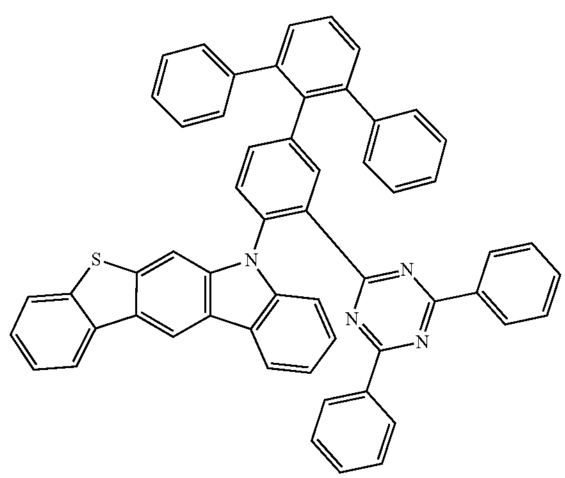
106
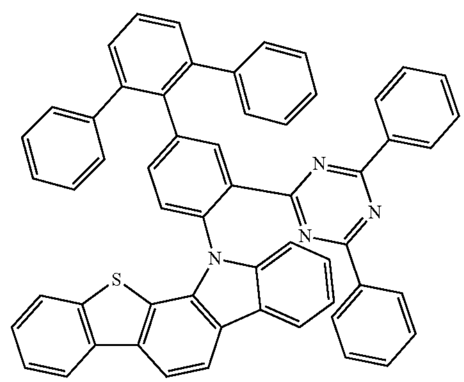

-continued
107
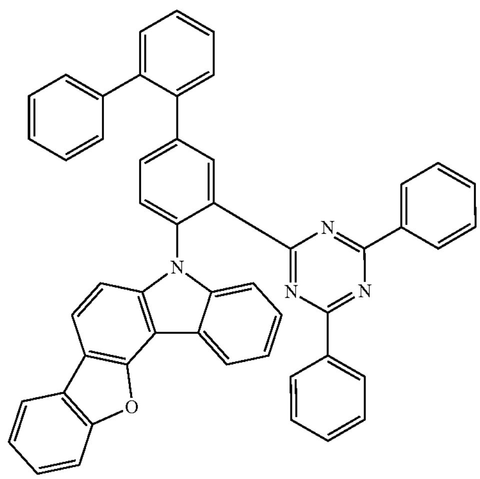
108
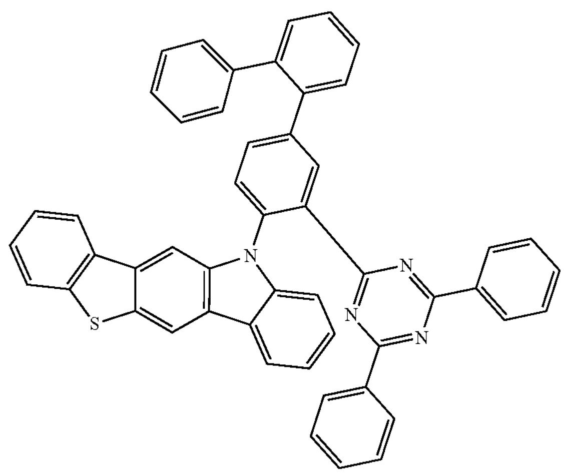
109
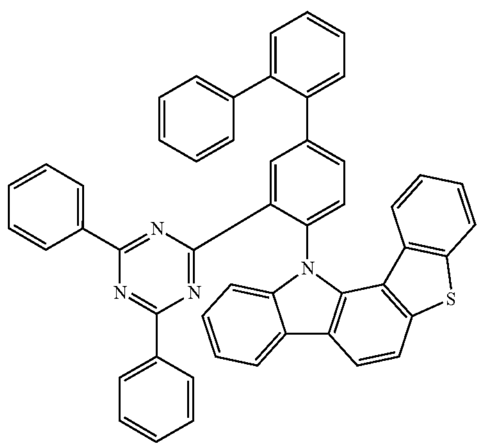
-continued
110
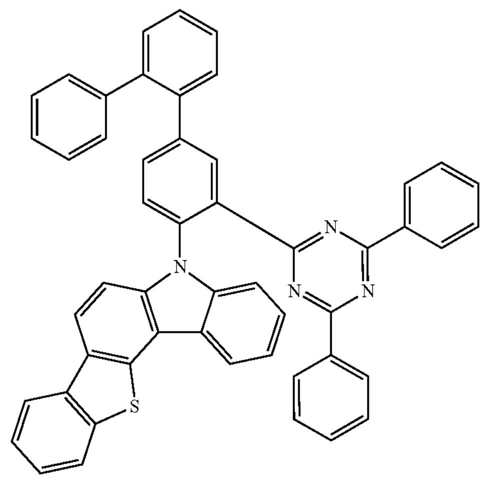
111
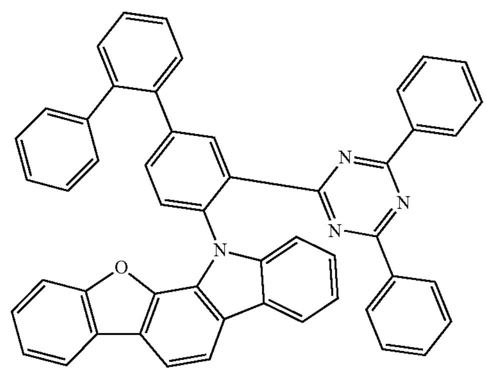
112
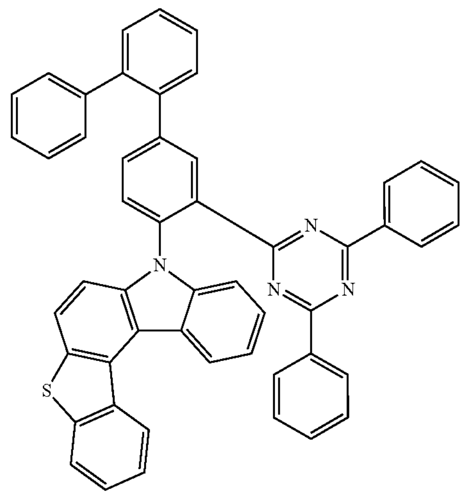

-continued
113
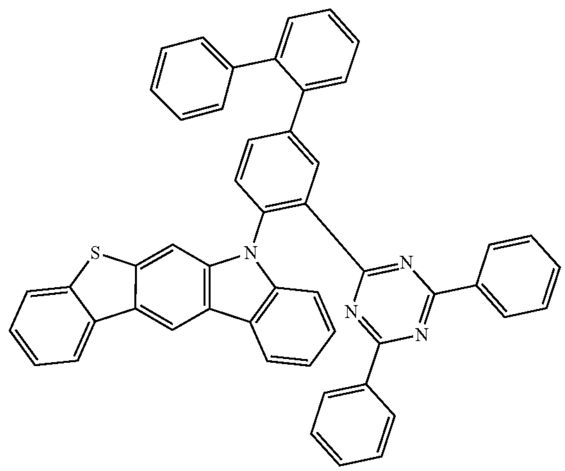
114
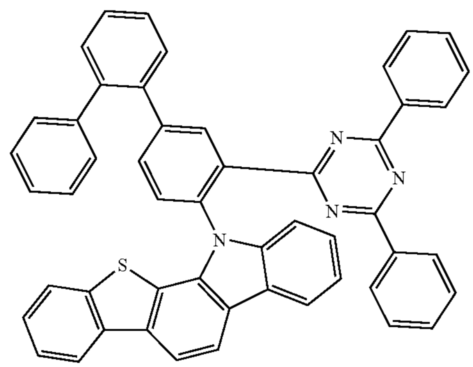
115
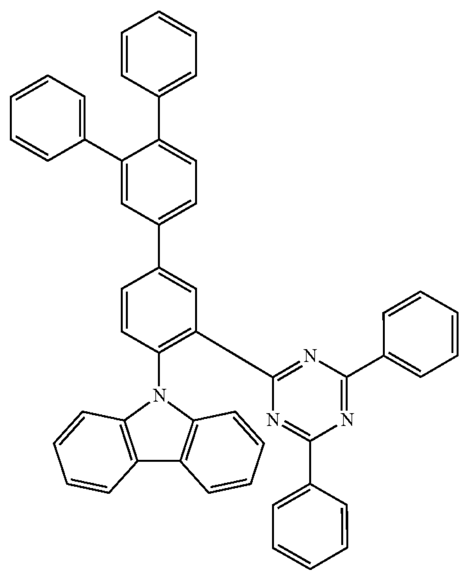
-continued
116
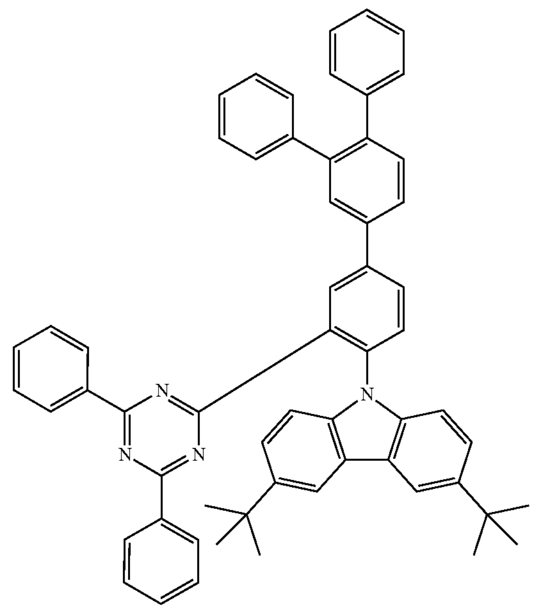
117
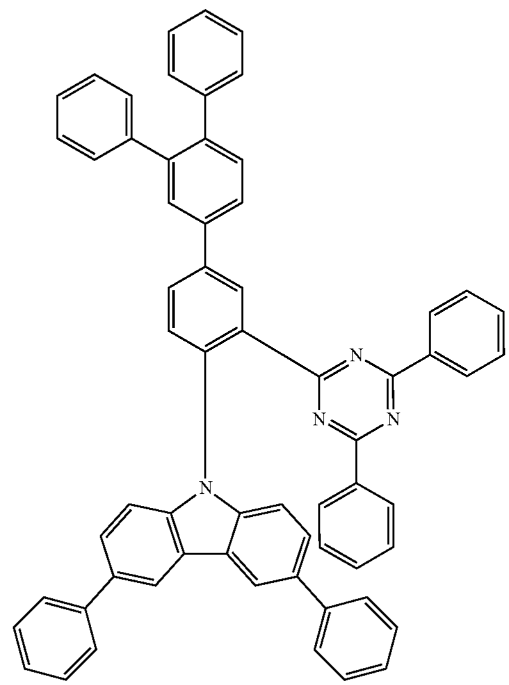

-continued
118
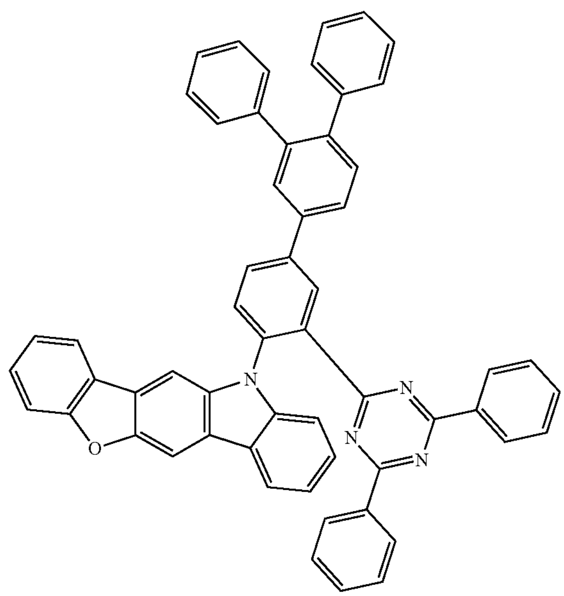
119
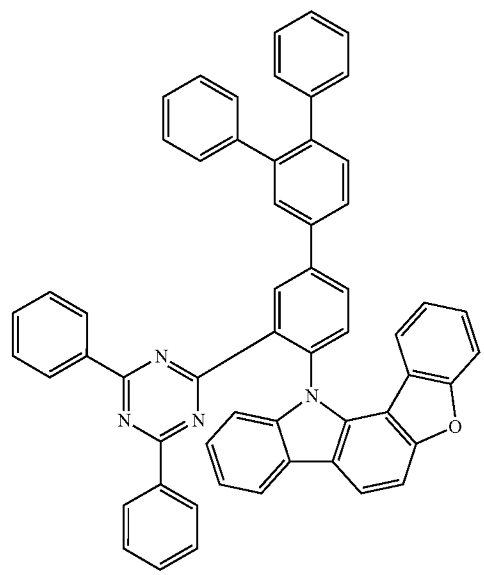
-continued
120
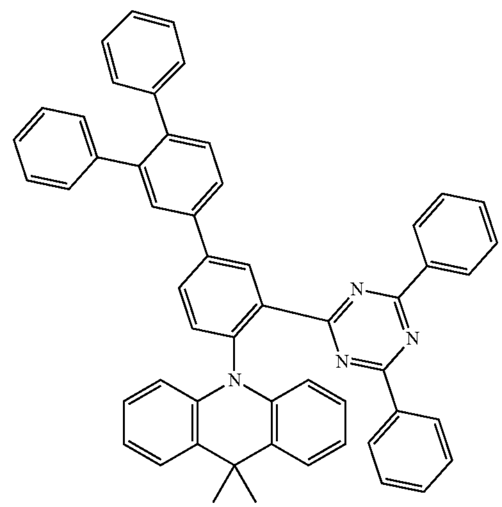
121
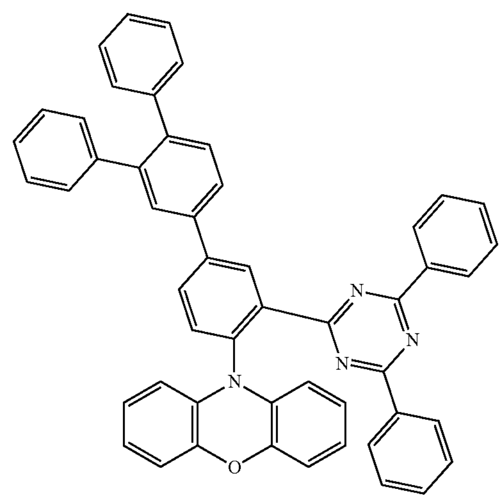
122
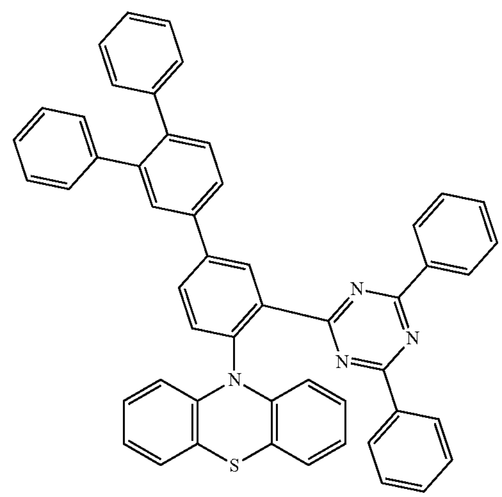

-continued
123
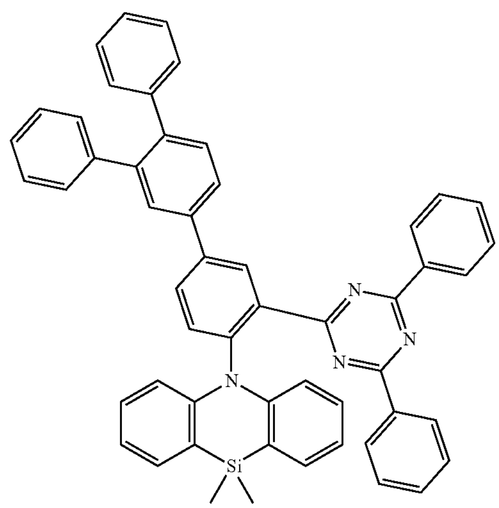
124
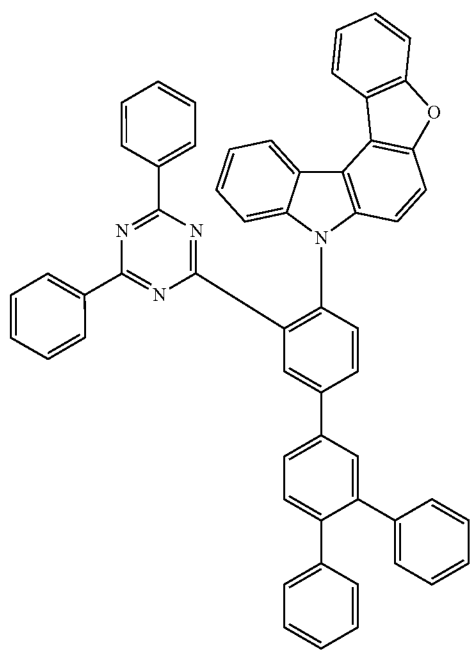
-continued
125
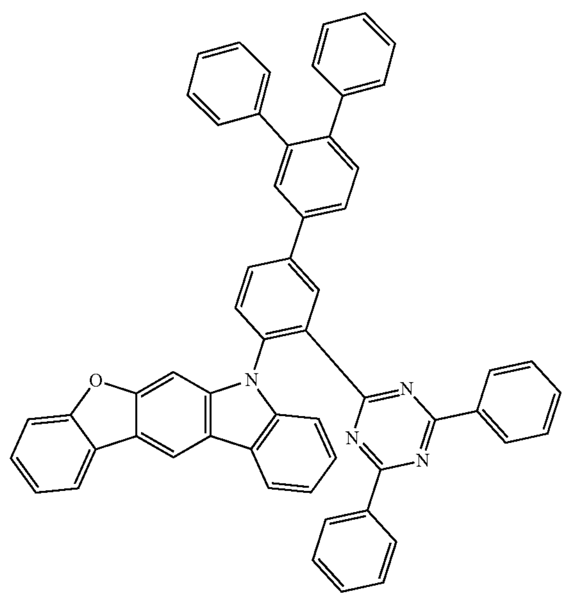
126
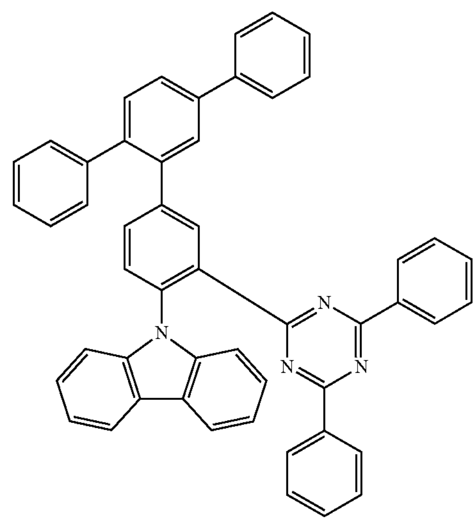

-continued
127
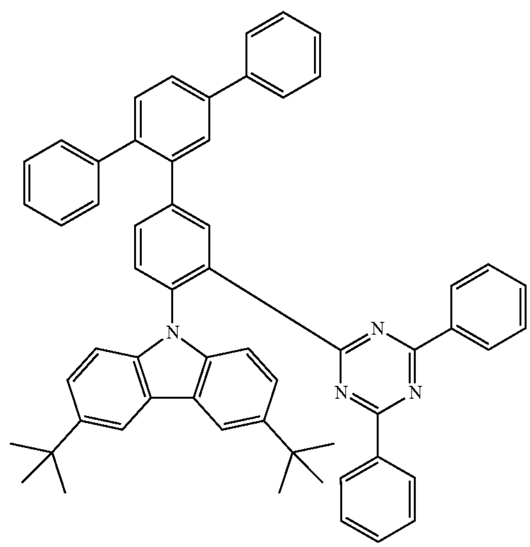
128
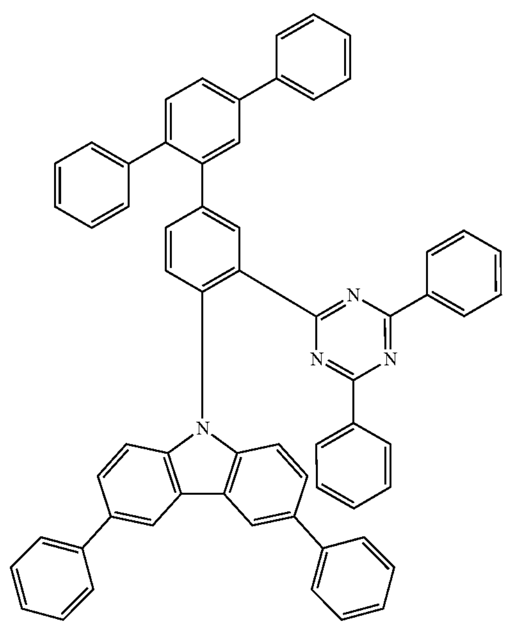
-continued
129
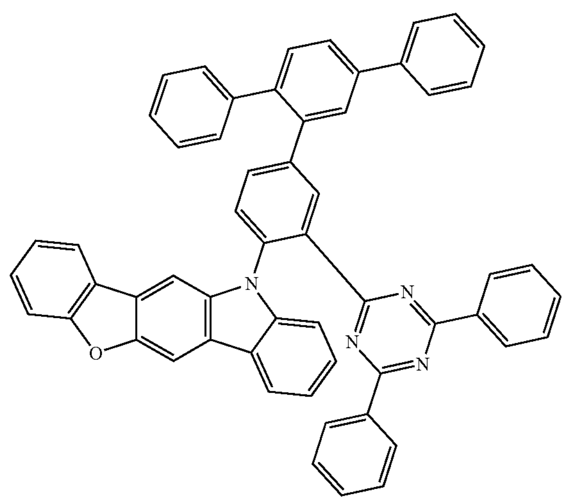
130
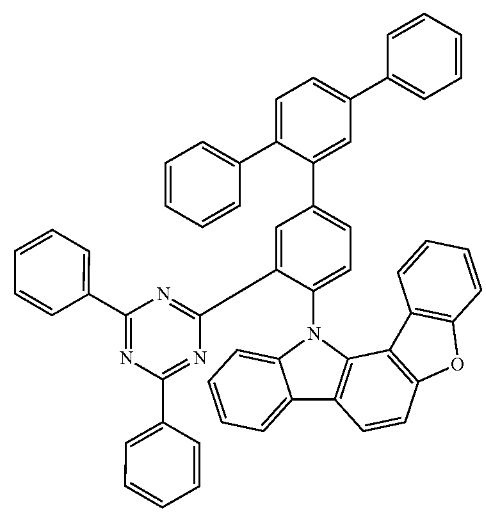
131
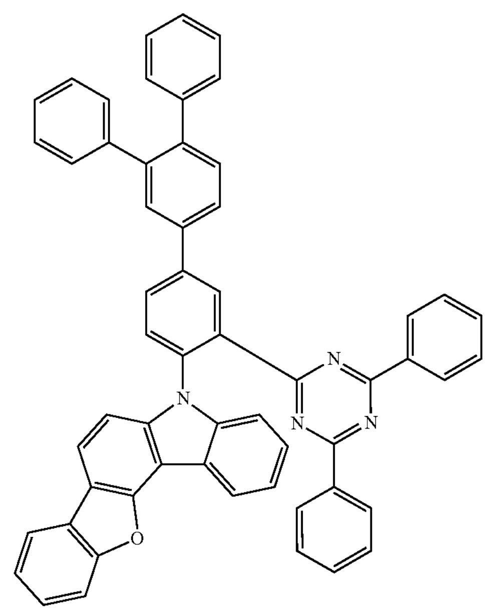

-continued
132
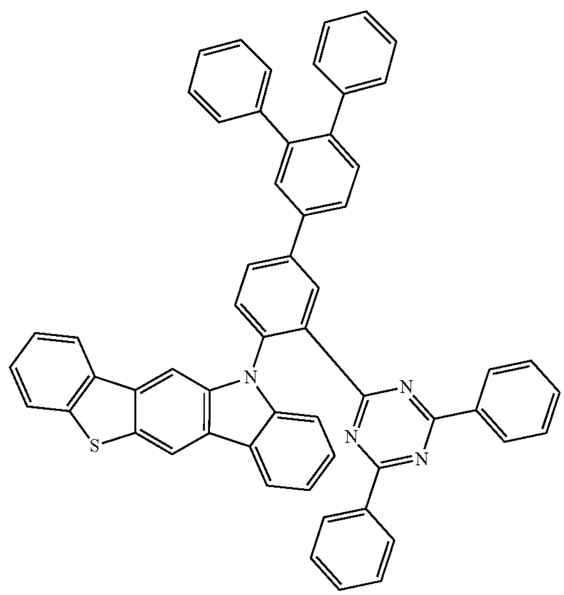
133
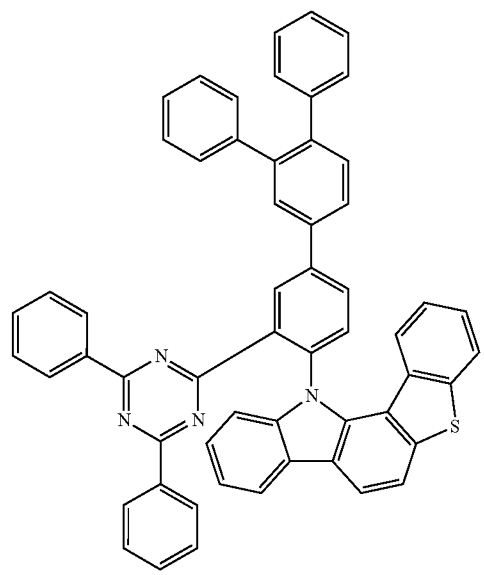
-continued
134
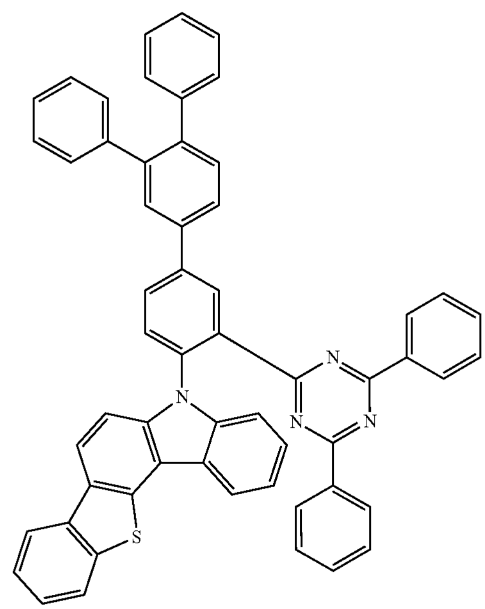
135
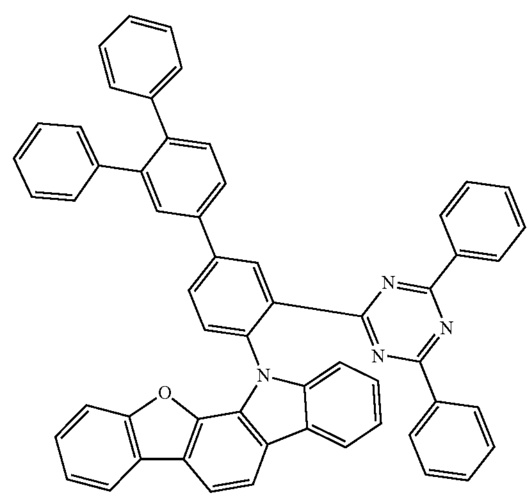

-continued
136
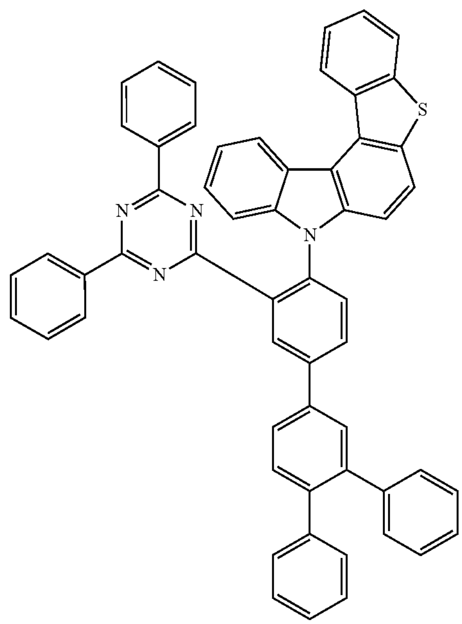
137
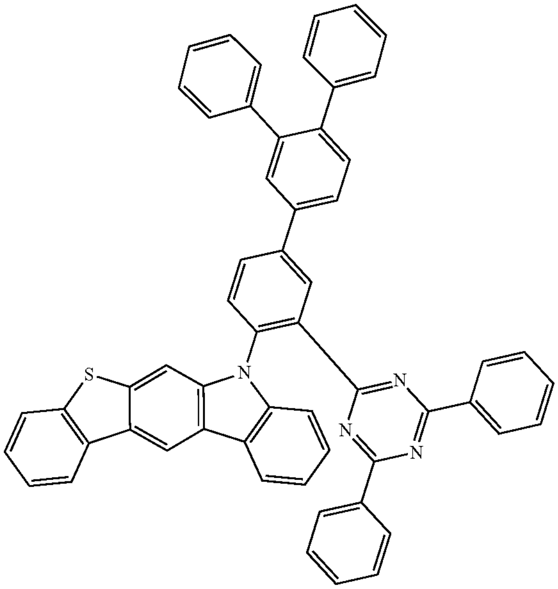
-continued
138
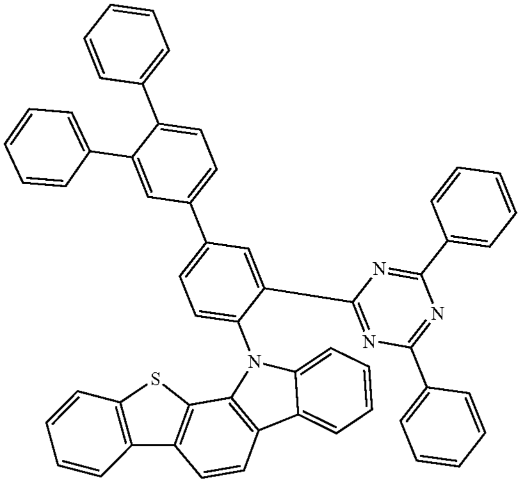
139
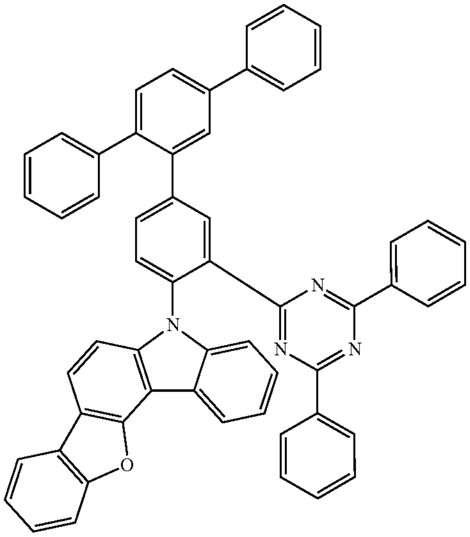
140
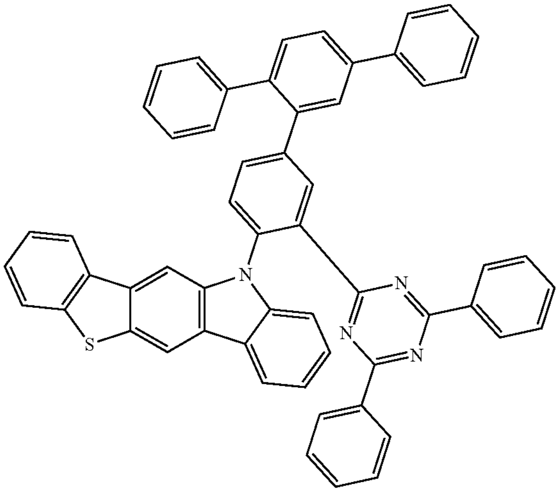

-continued
141
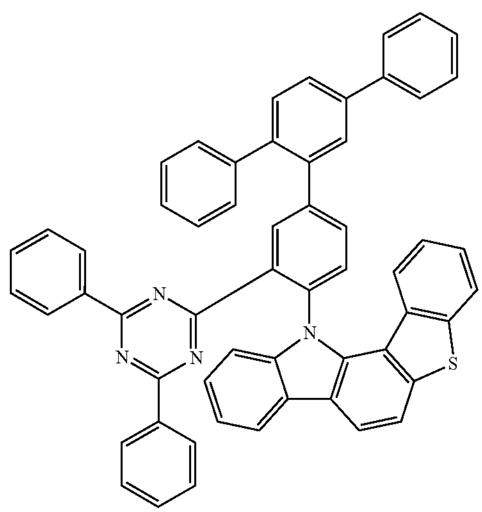
142
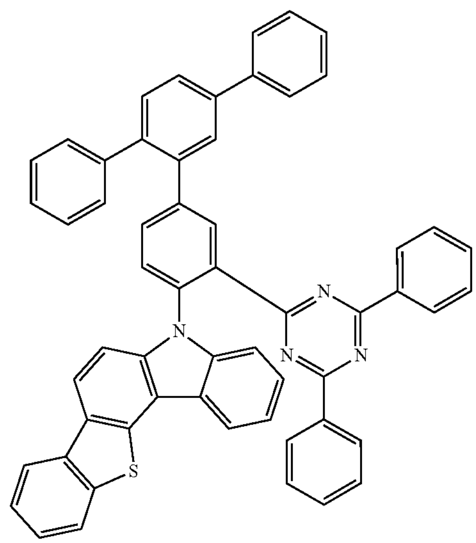
143
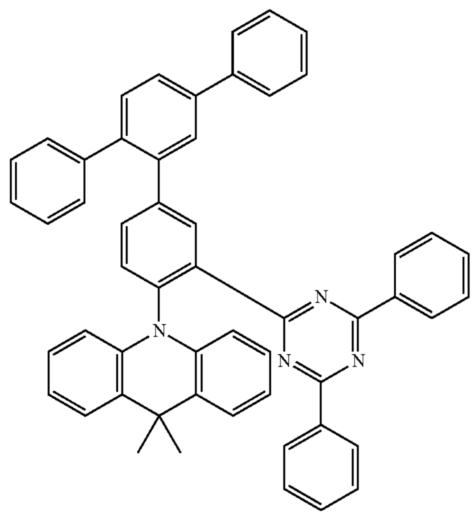
-continued
144
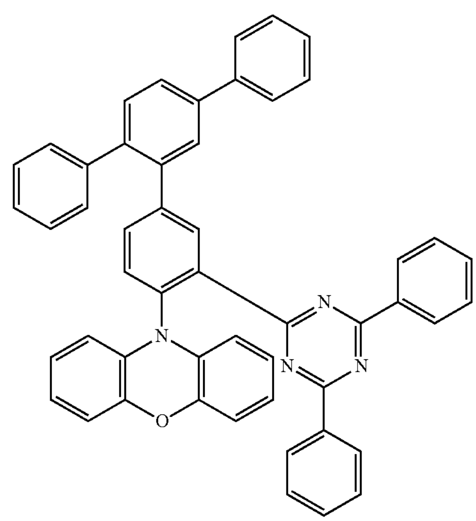
145
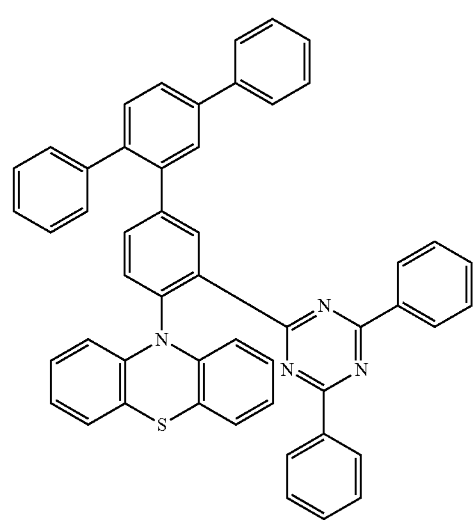
146
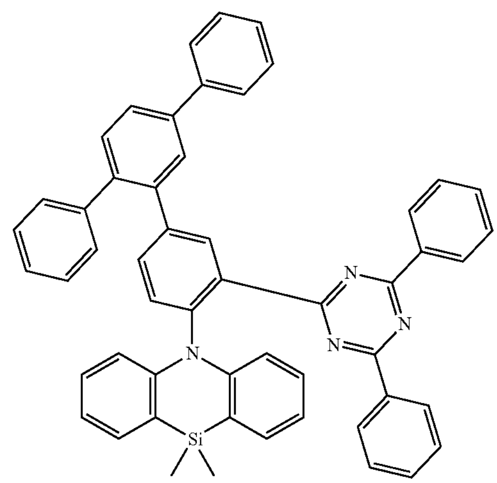

-continued
147
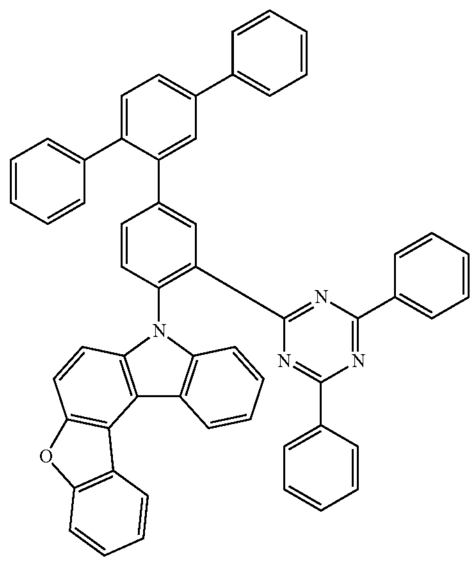
148
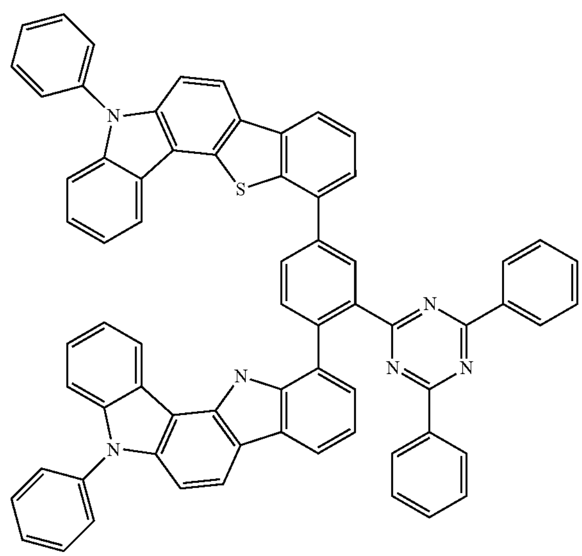
-continued
149
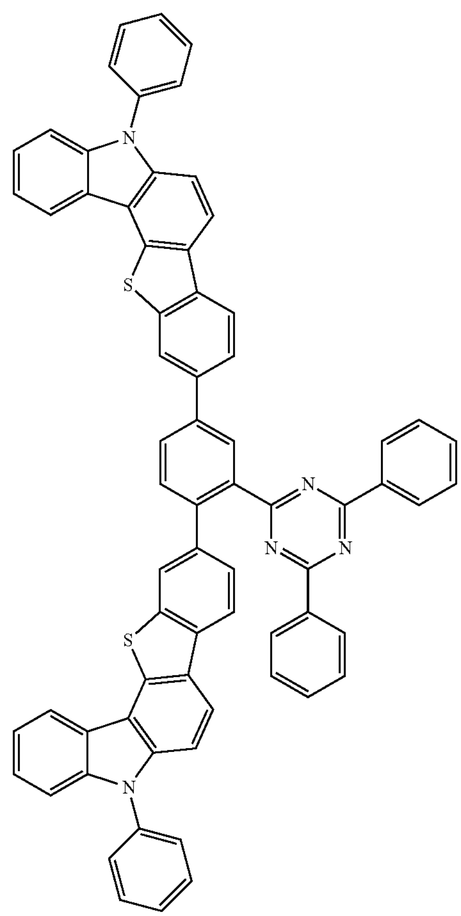

-continued
150
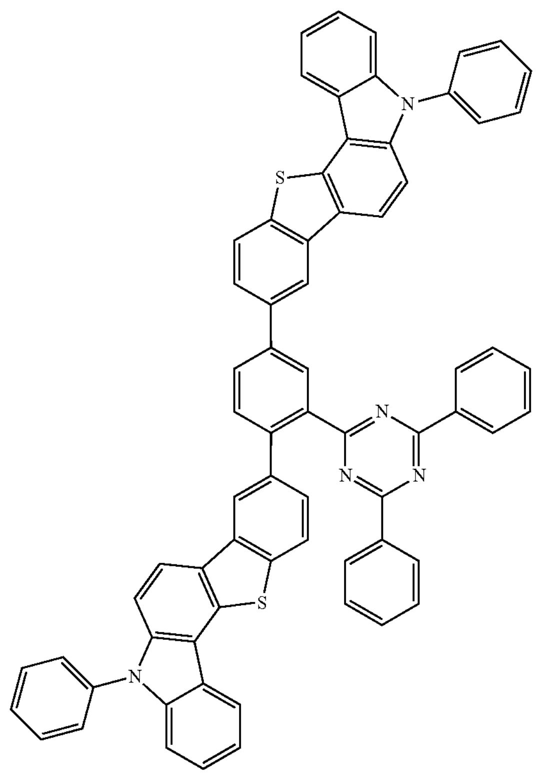
151
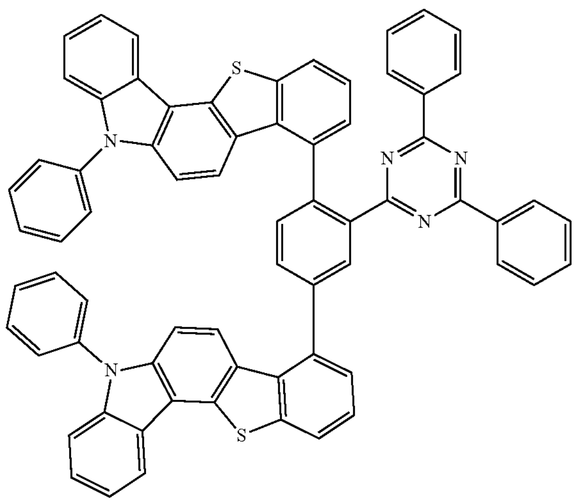
-continued
152
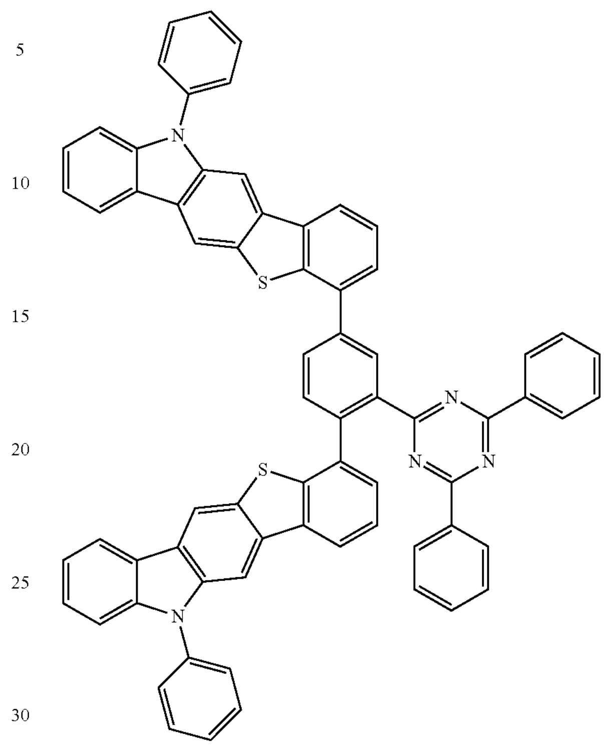
153
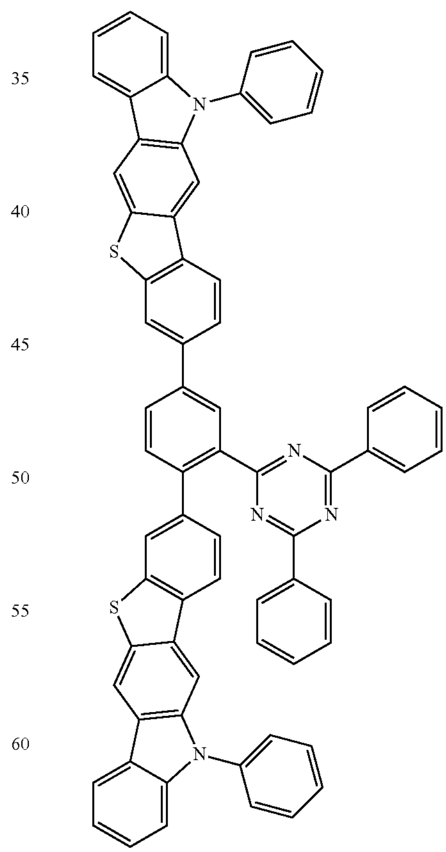

-continued
154
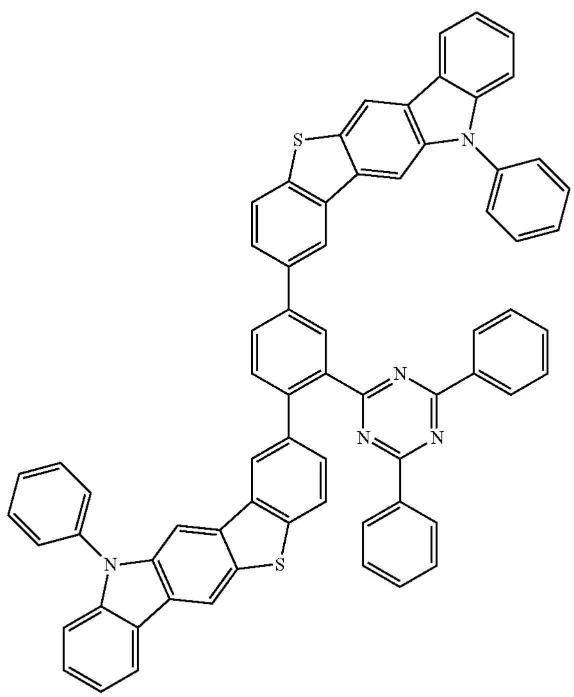
155
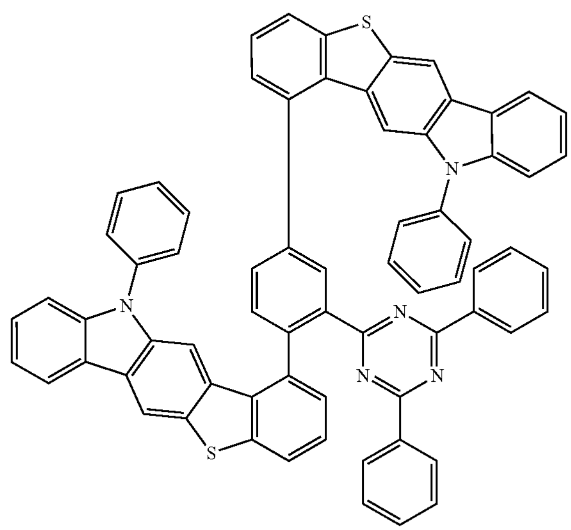
-continued
156
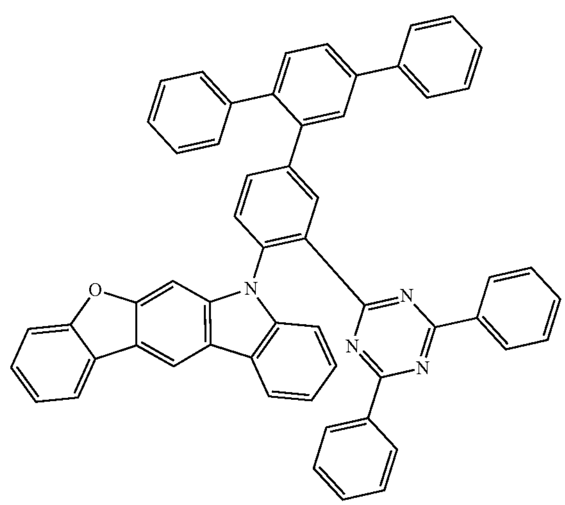
157
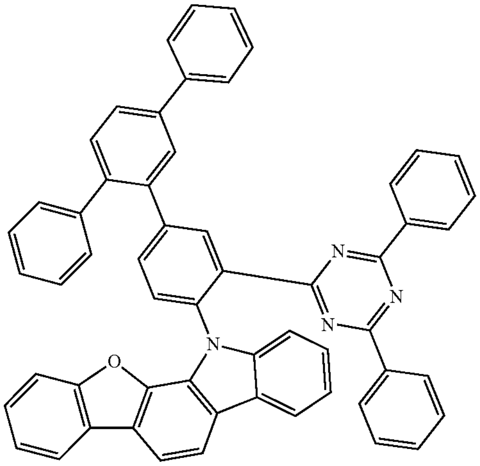
158
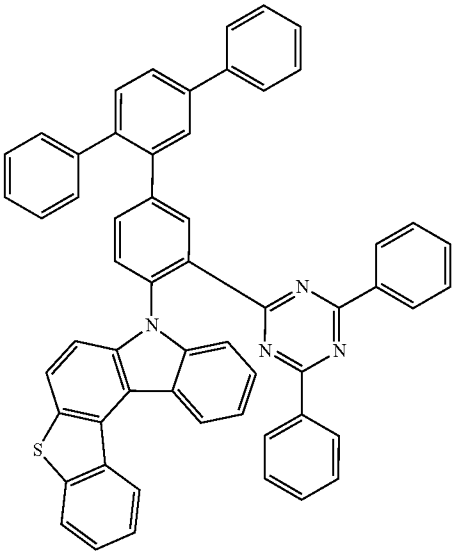

-continued
159
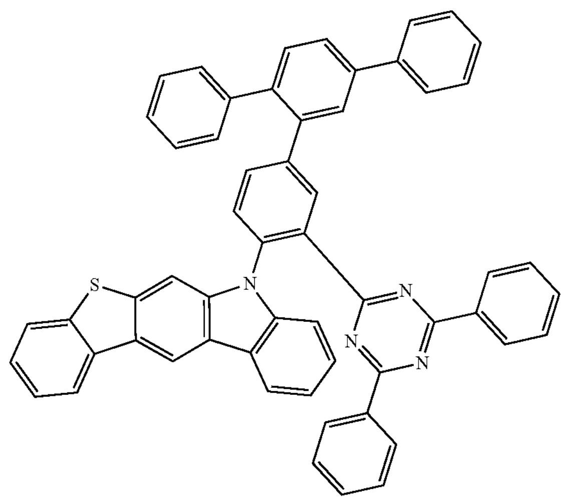
160
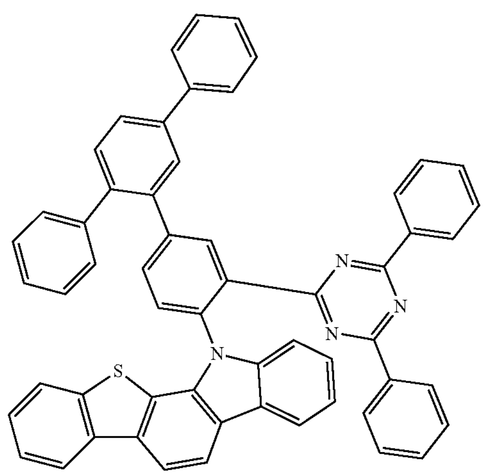
-continued
161
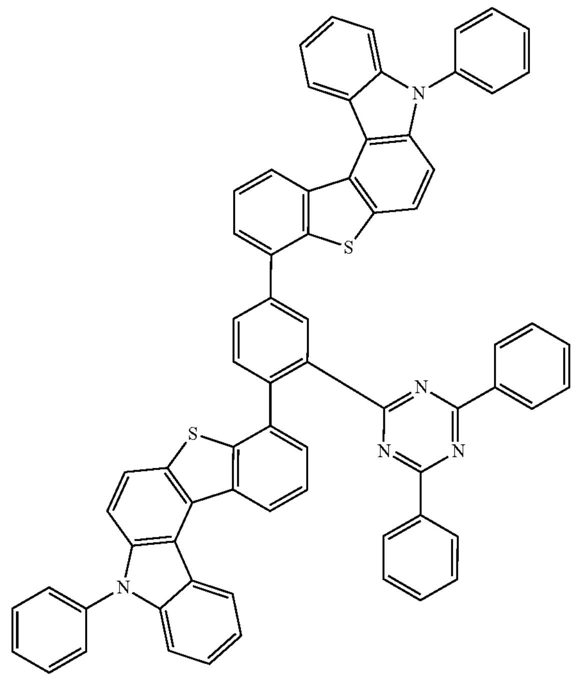
162
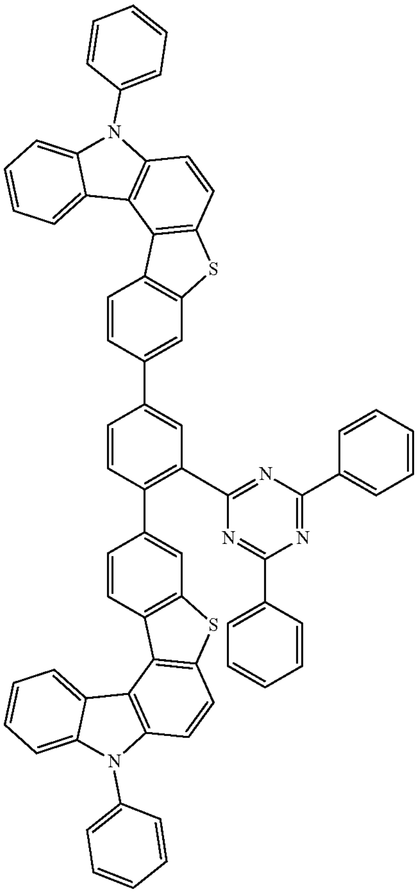

-continued
163
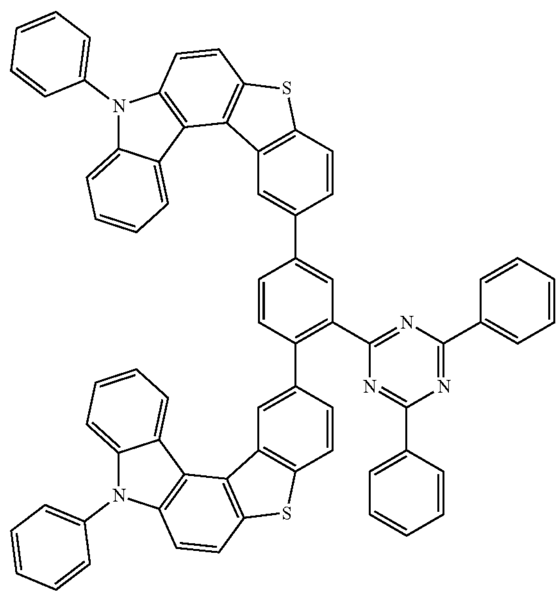
164
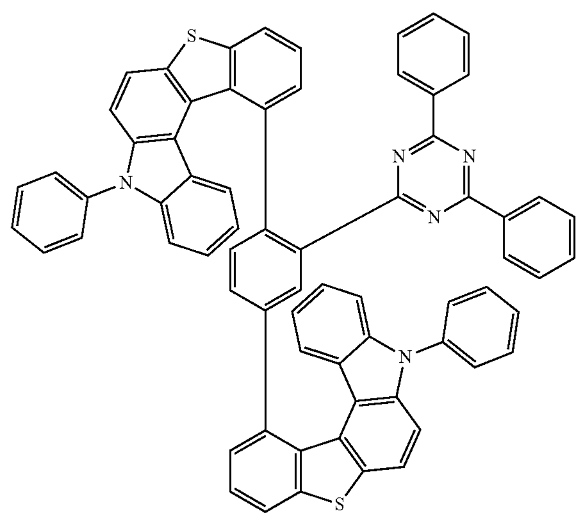
-continued
165
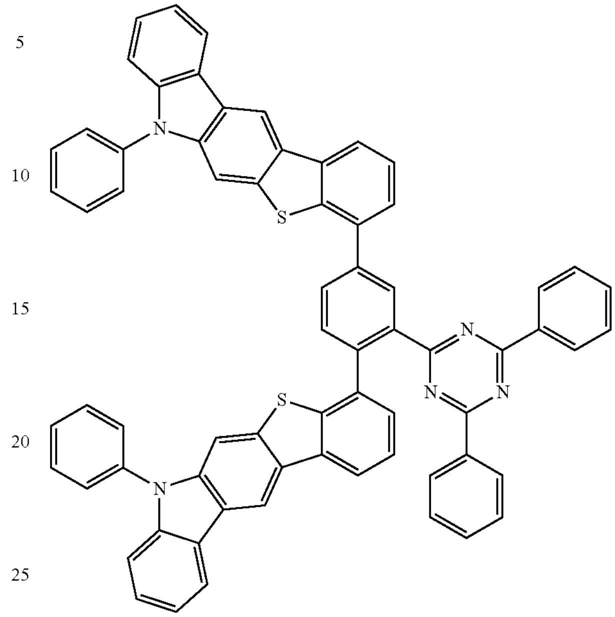
166
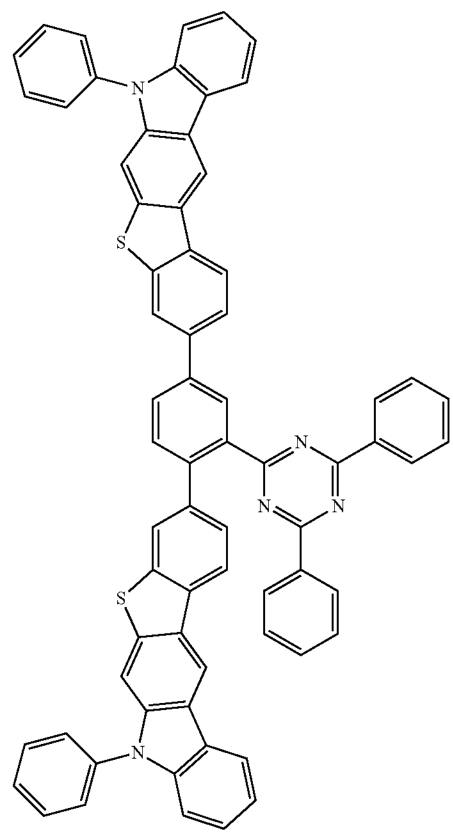

-continued
167
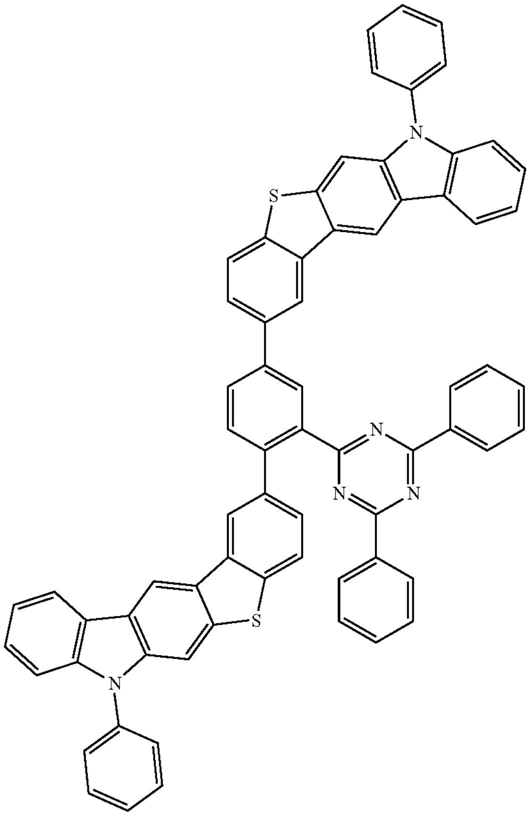
168
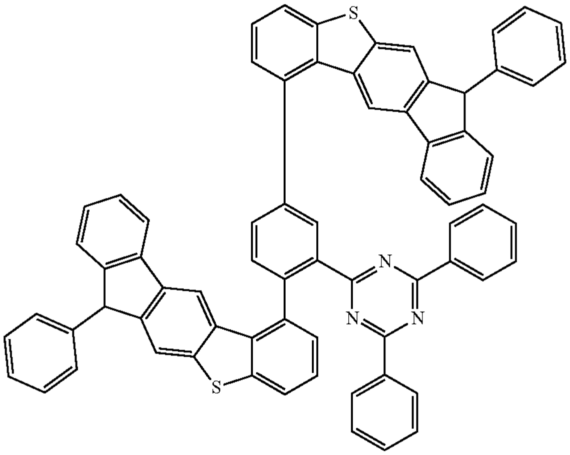
-continued
169
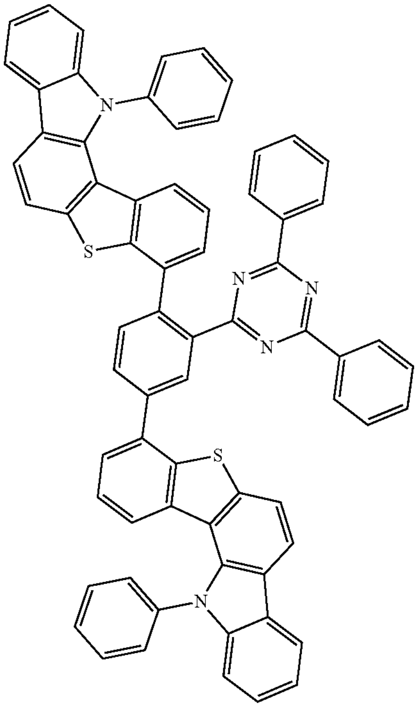
170
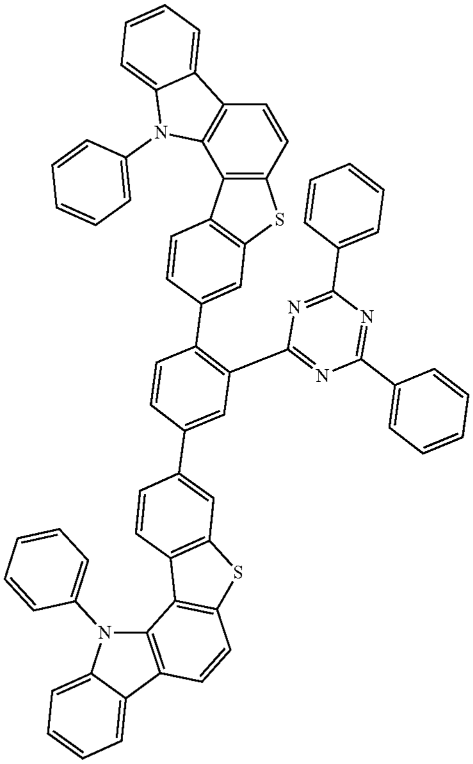

-continued
171
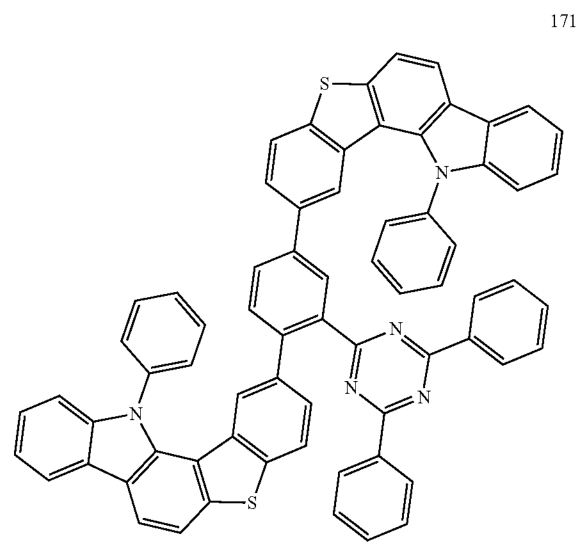
172
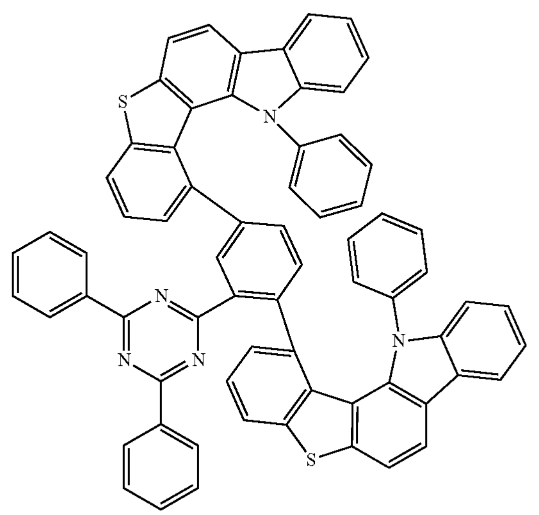
173
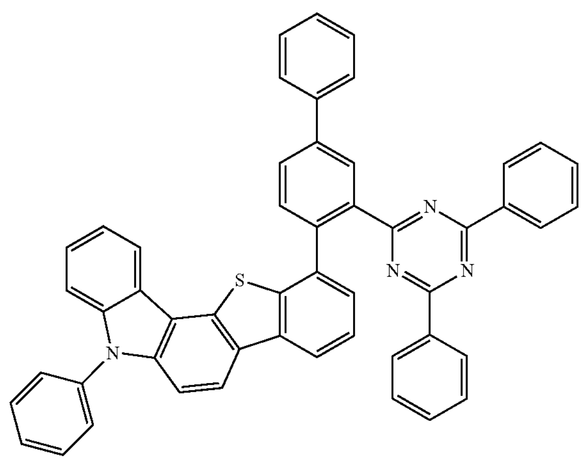
-continued
174
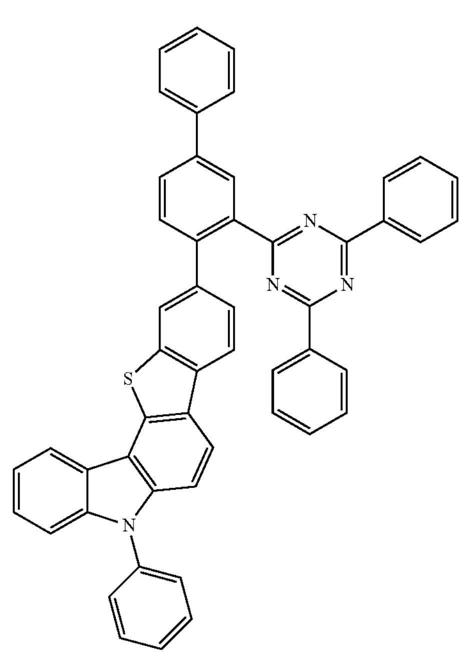
175
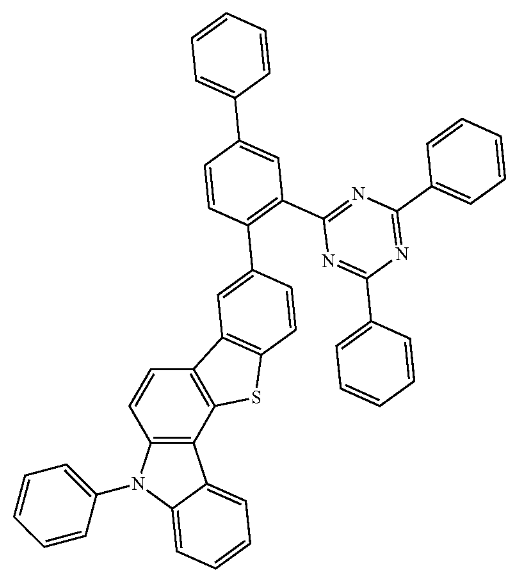
176
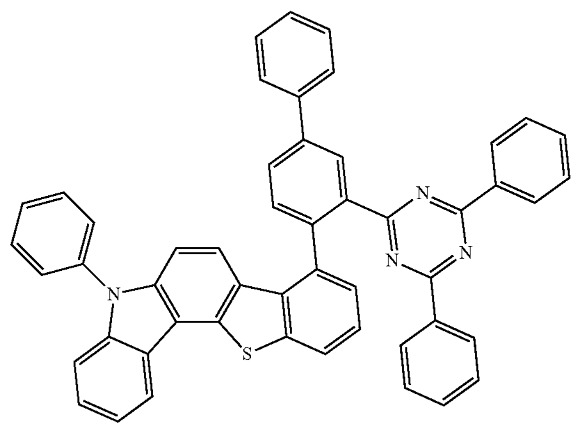

-continued
177
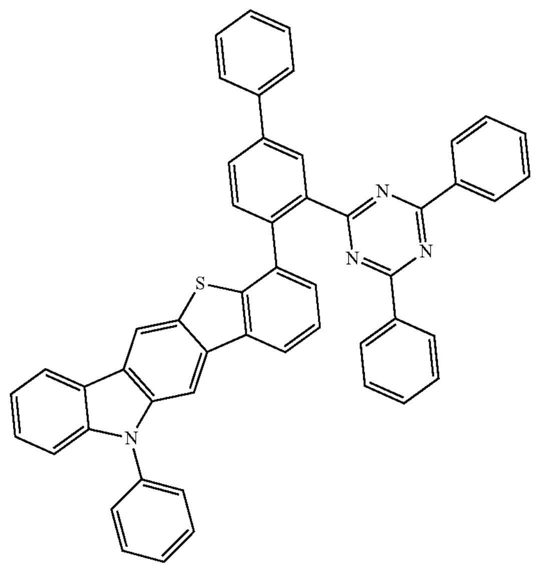
178
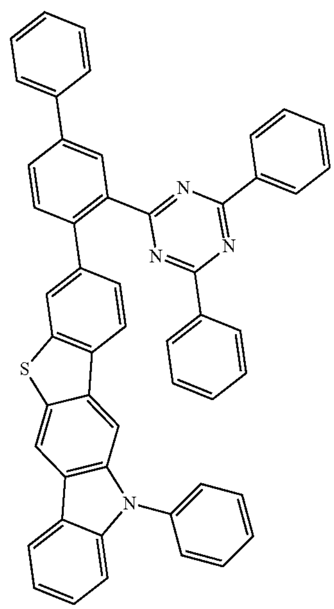
-continued
179
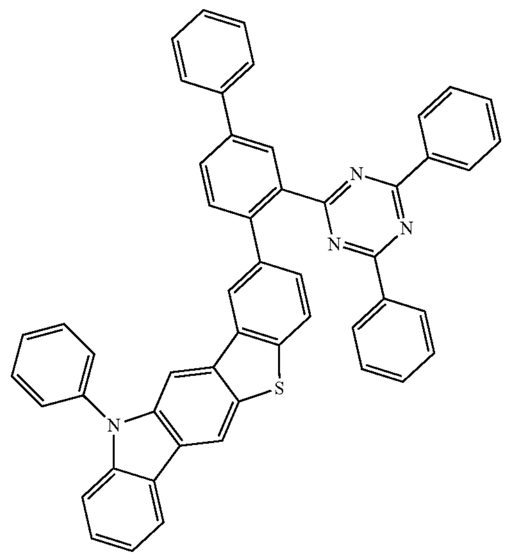
180
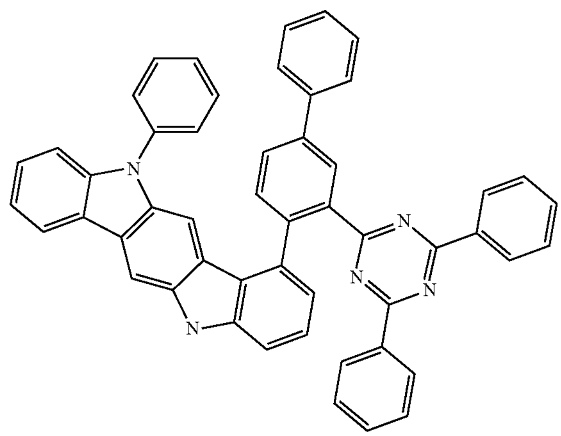
181
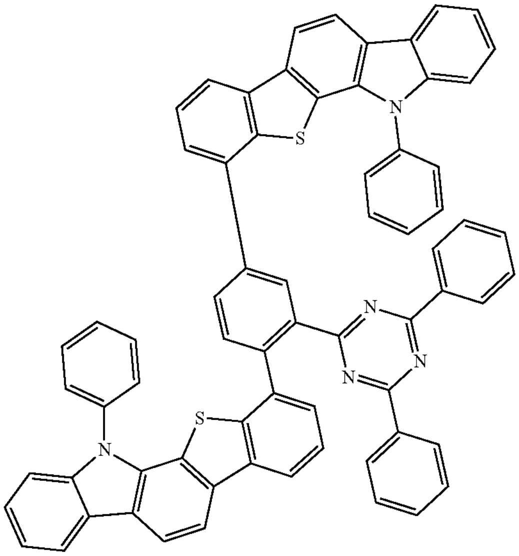

-continued
182
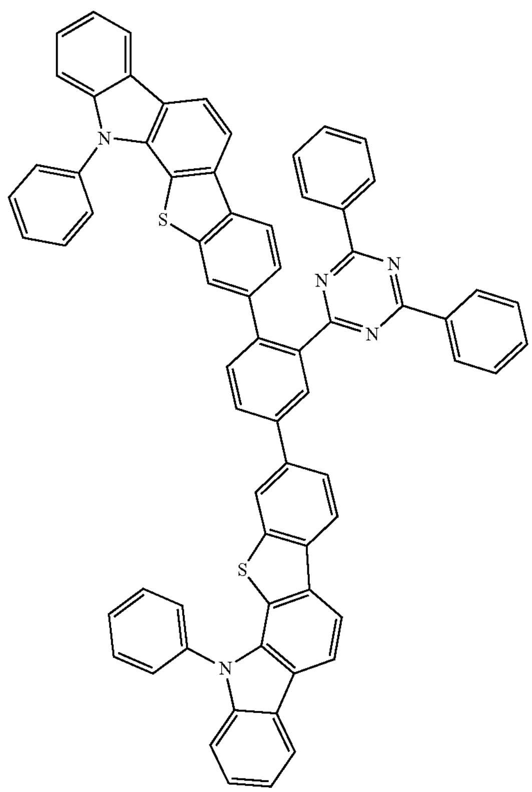
183
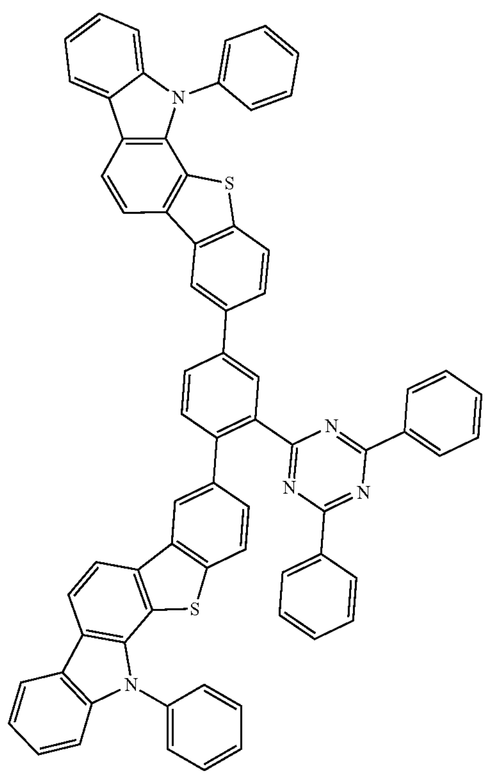
-continued
184
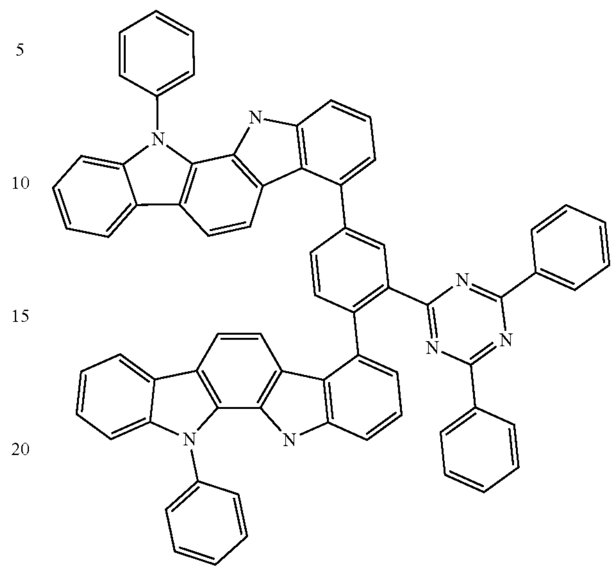
185
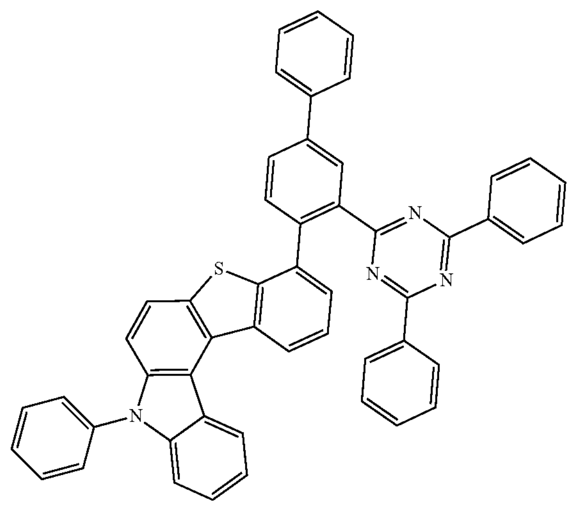

-continued
186
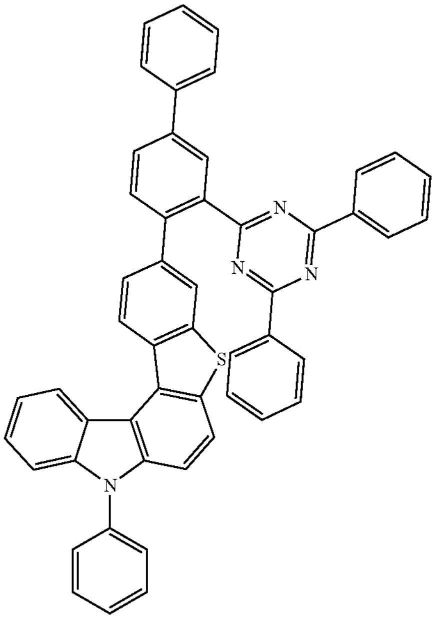
187
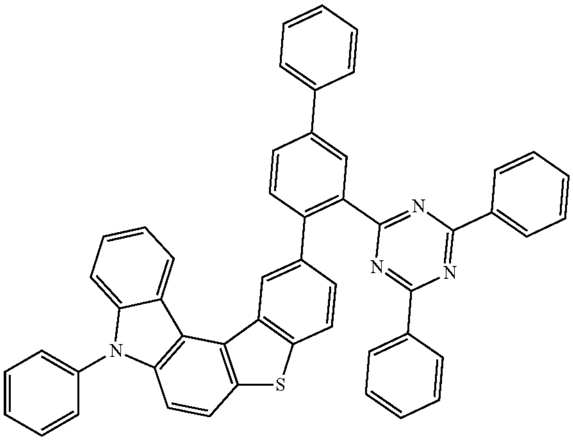
188
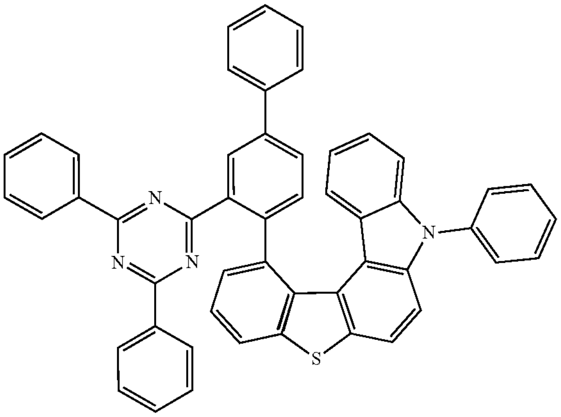
-continued
189
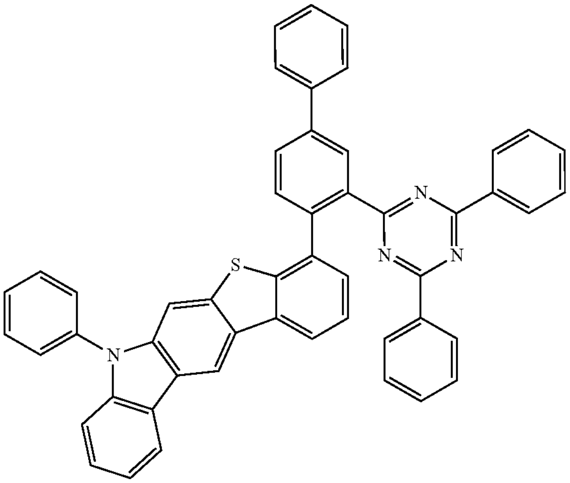
190
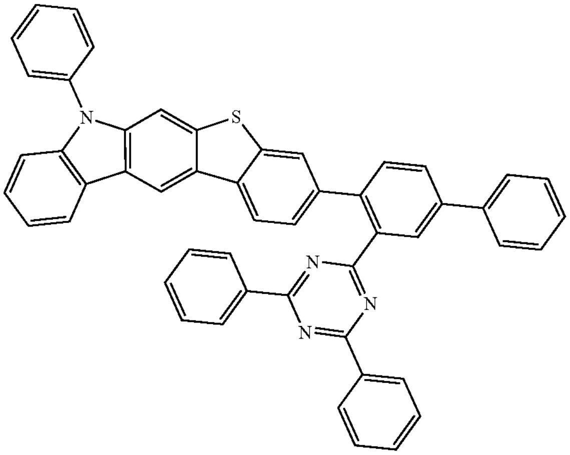
191
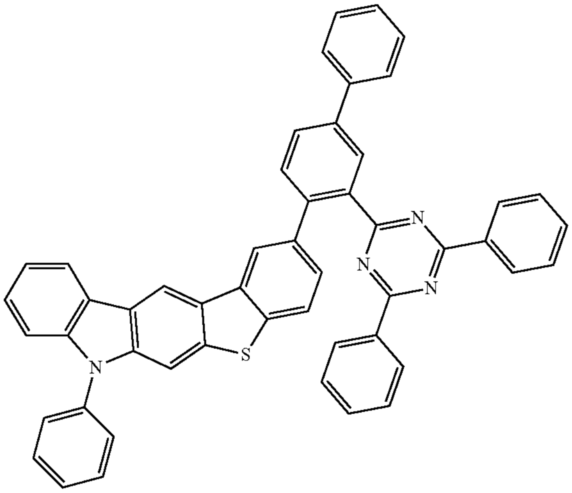

-continued
192
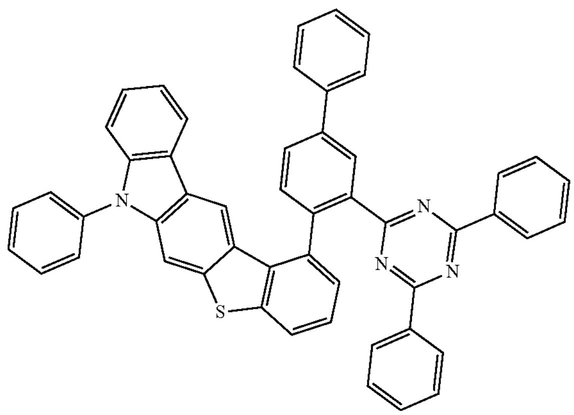
193
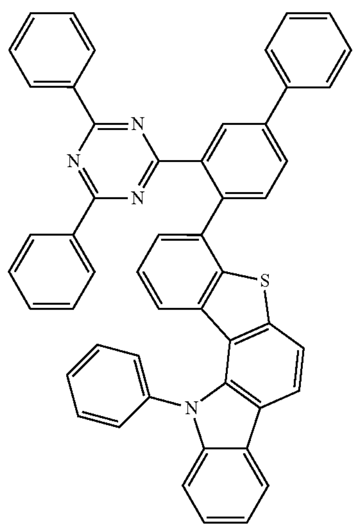
194
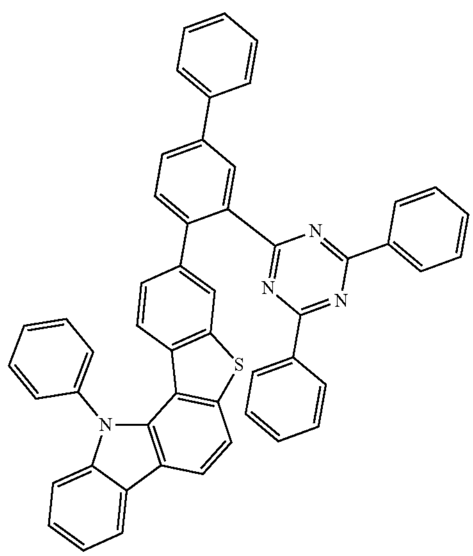
-continued
195
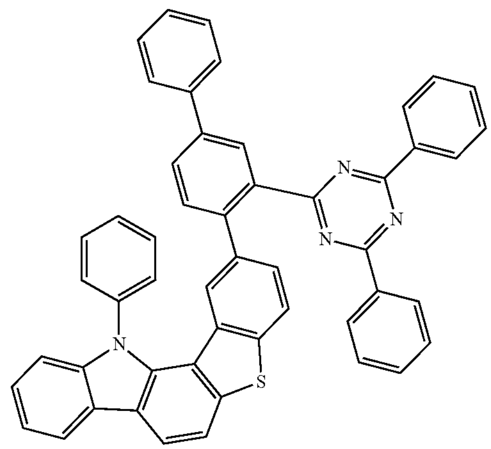
196
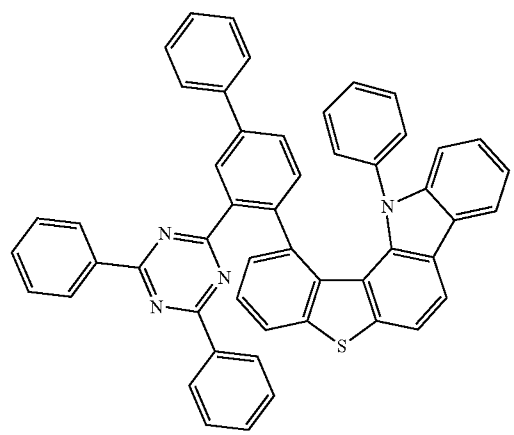
197
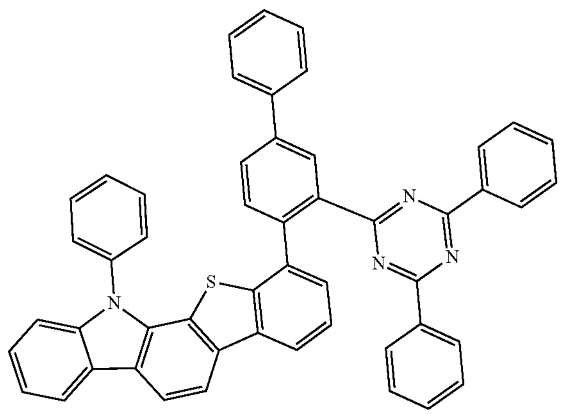

-continued
198
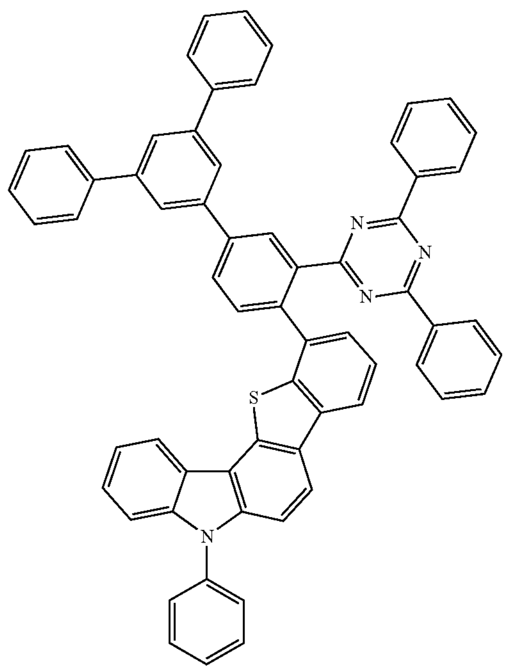
199
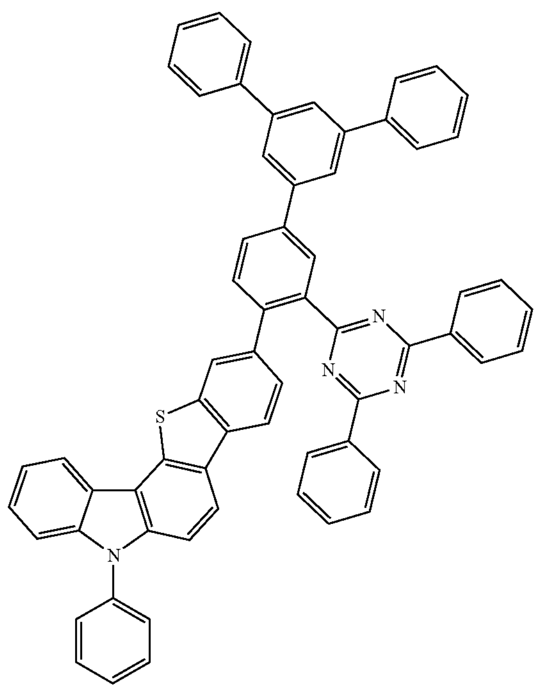
-continued
200
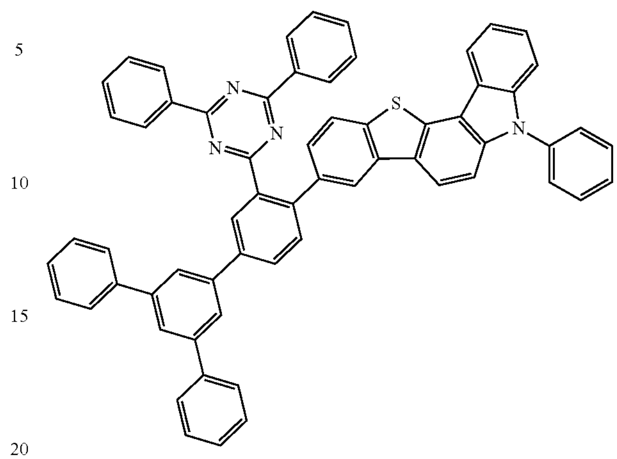
201
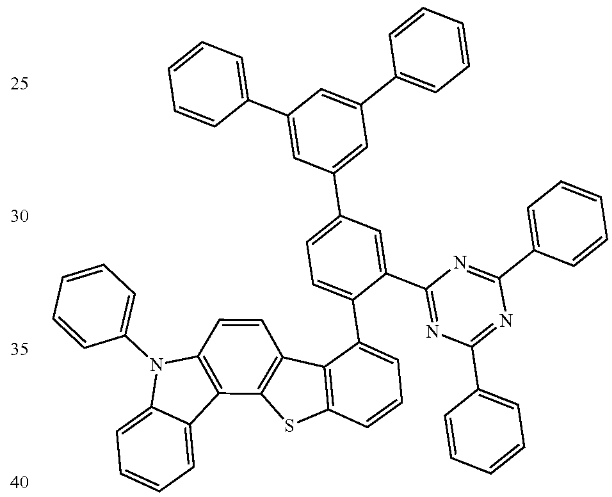
202
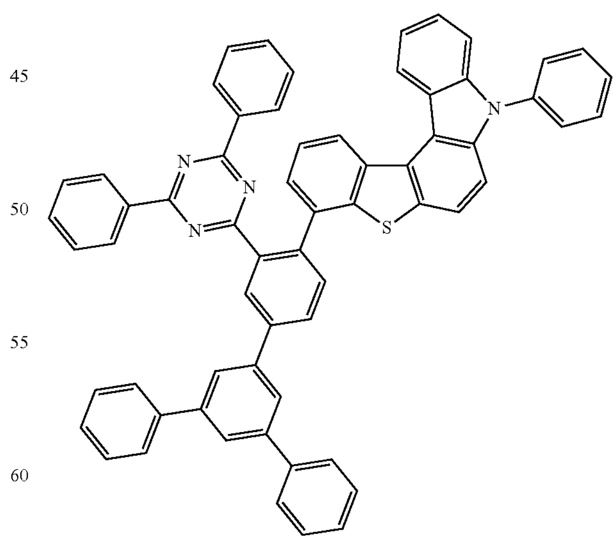

-continued
203
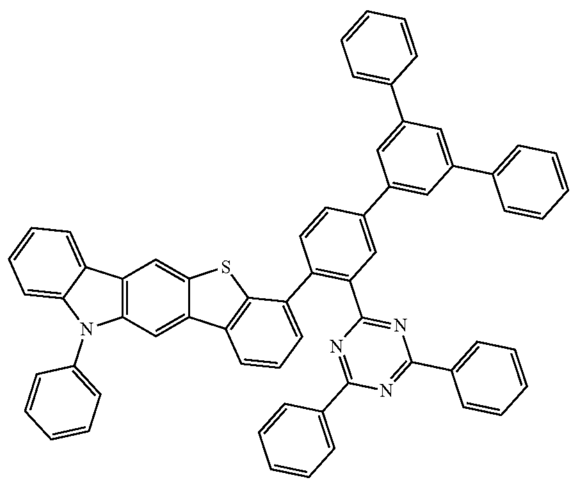
204
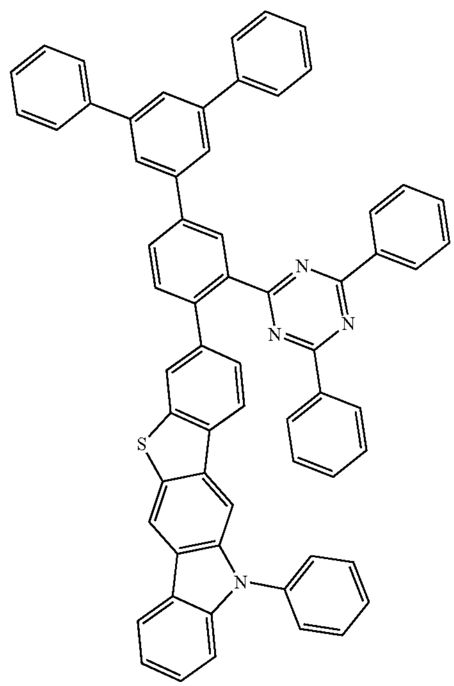
-continued
205
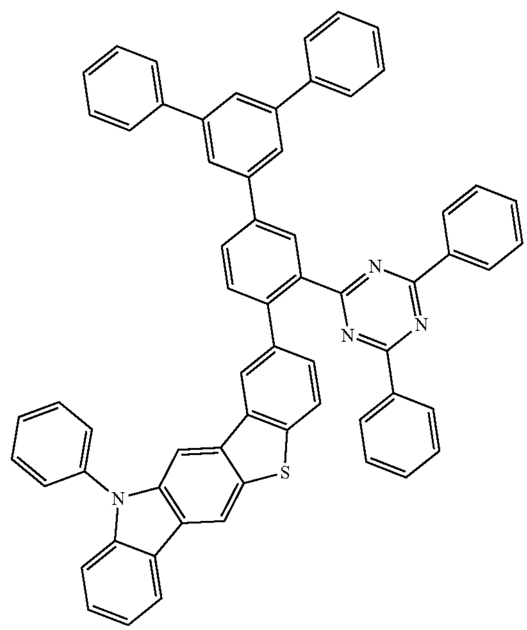
206
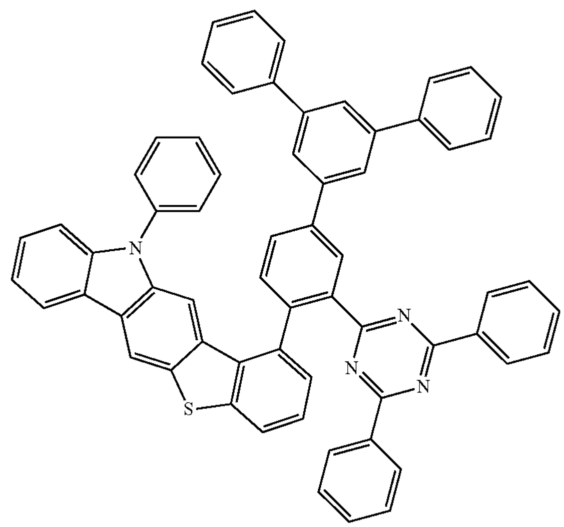

-continued
207
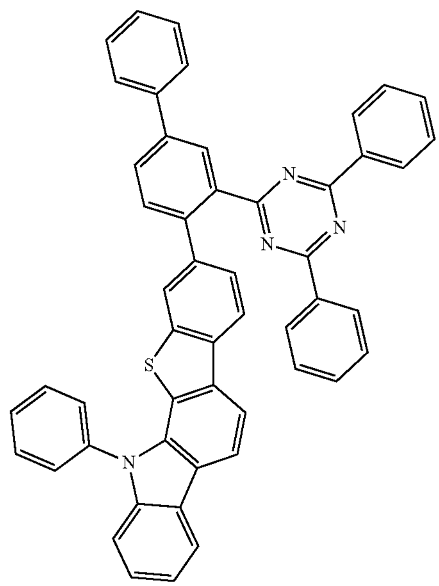
208
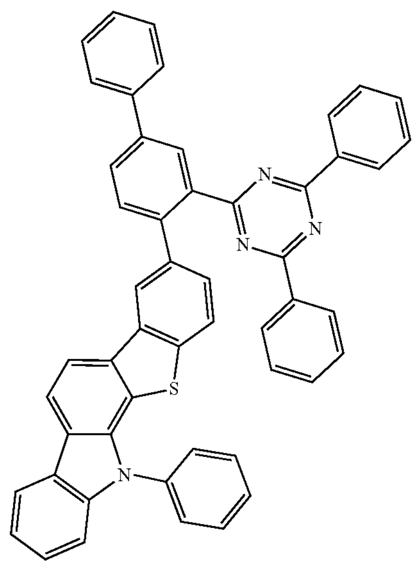
209
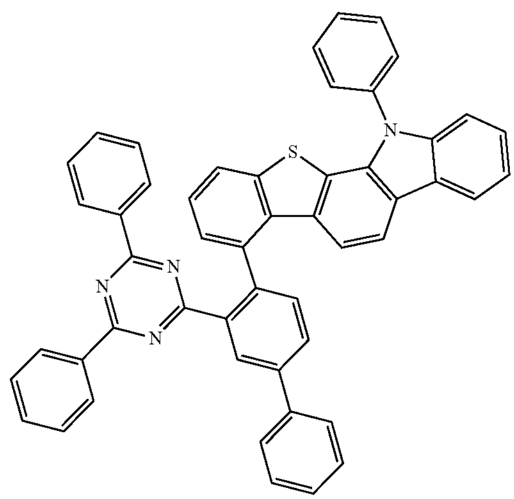
-continued
210
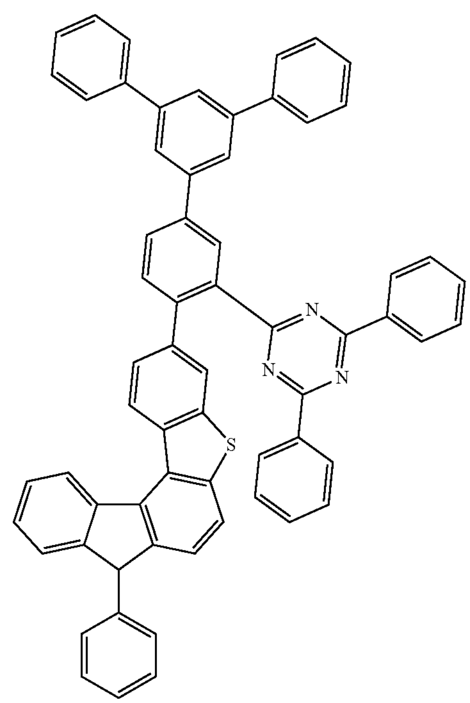
211
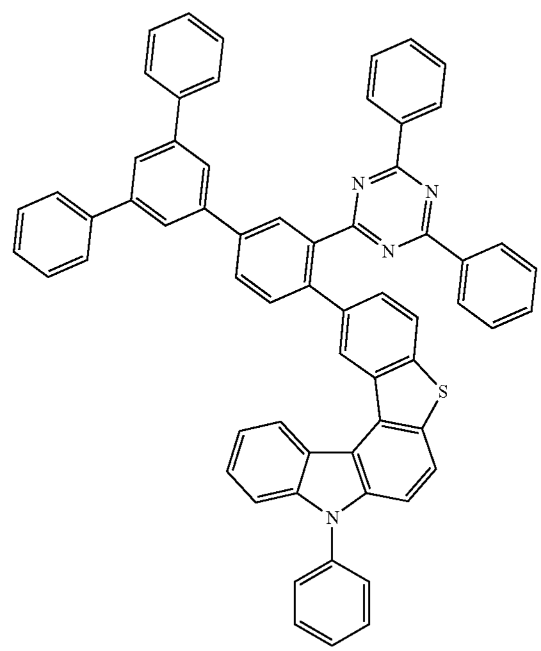

-continued
212
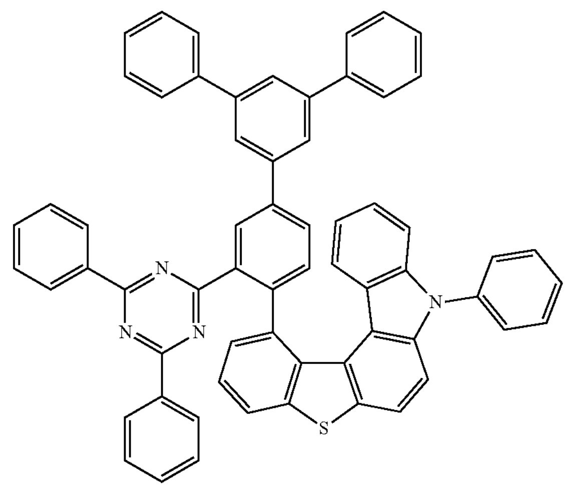
213
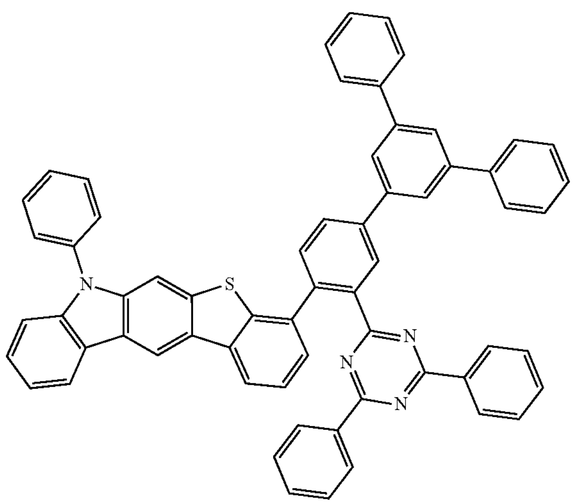
214
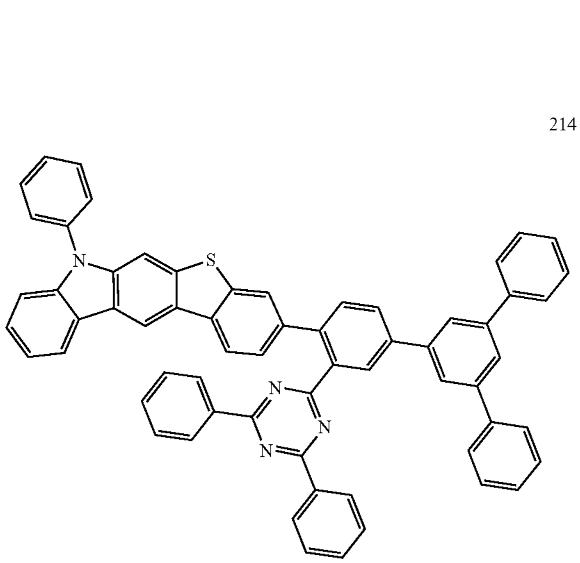
-continued
215
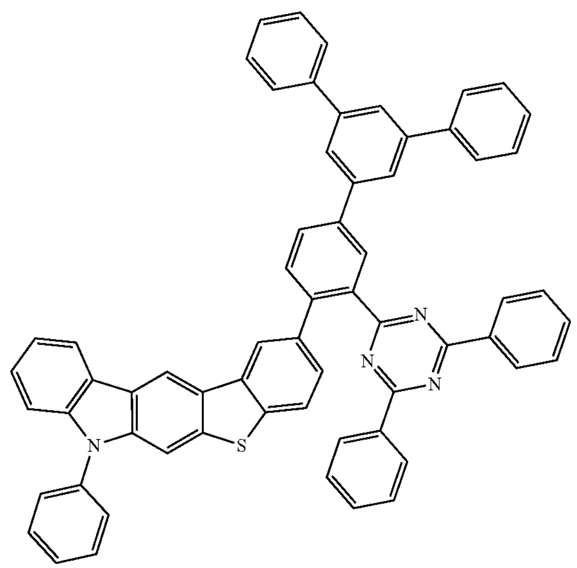
216
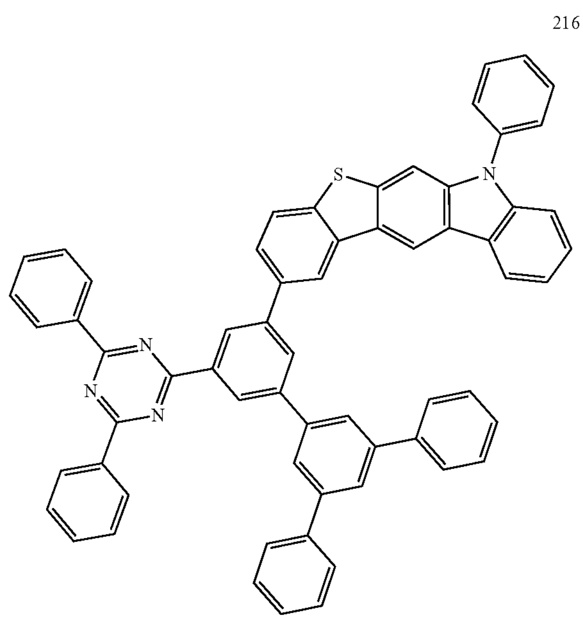

-continued
217
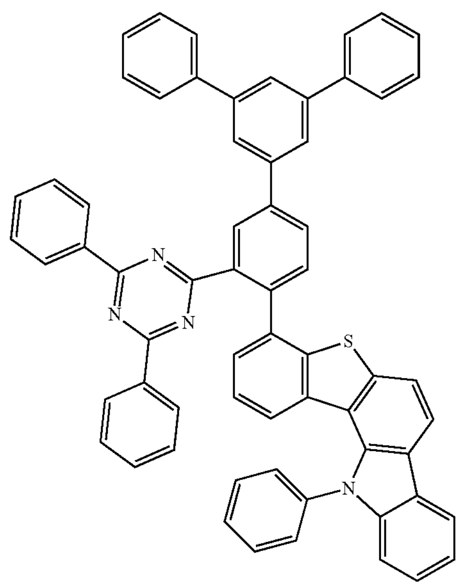
218
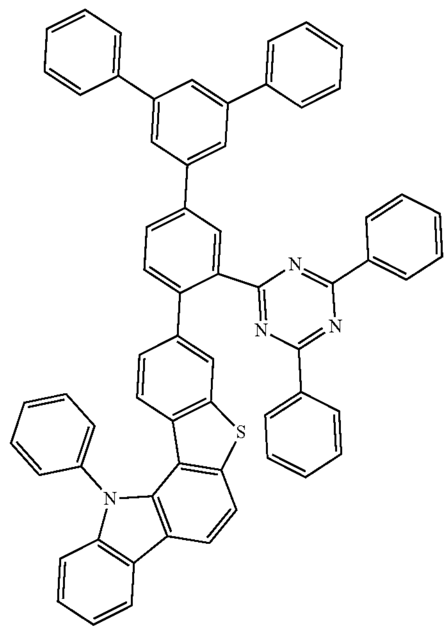
219
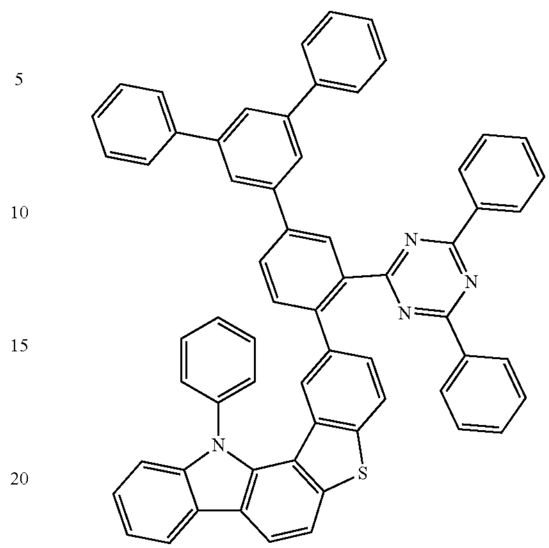
220
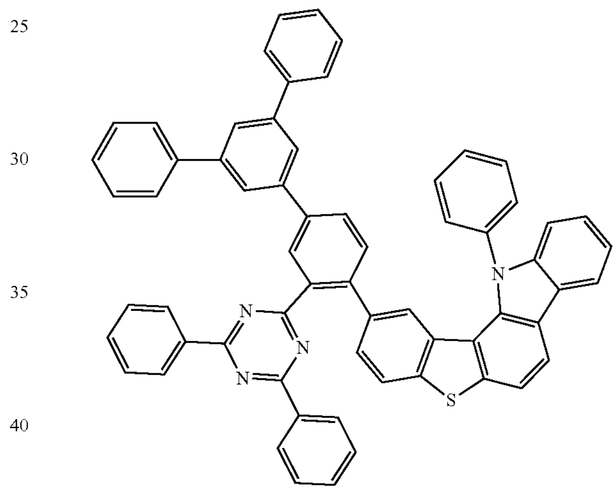
221
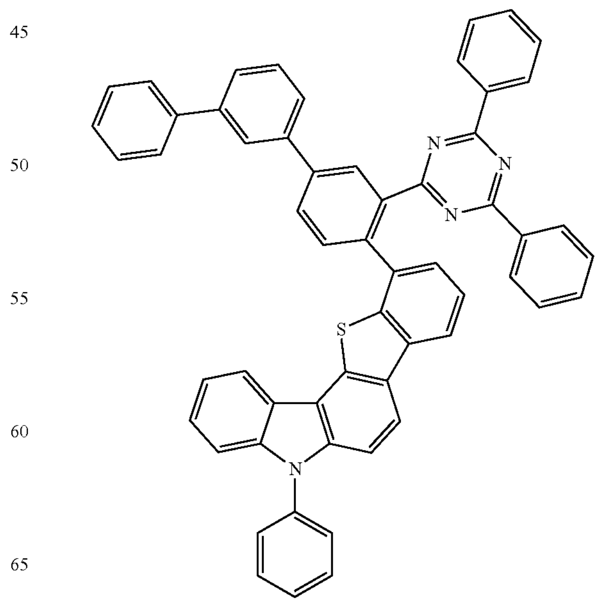

-continued
222
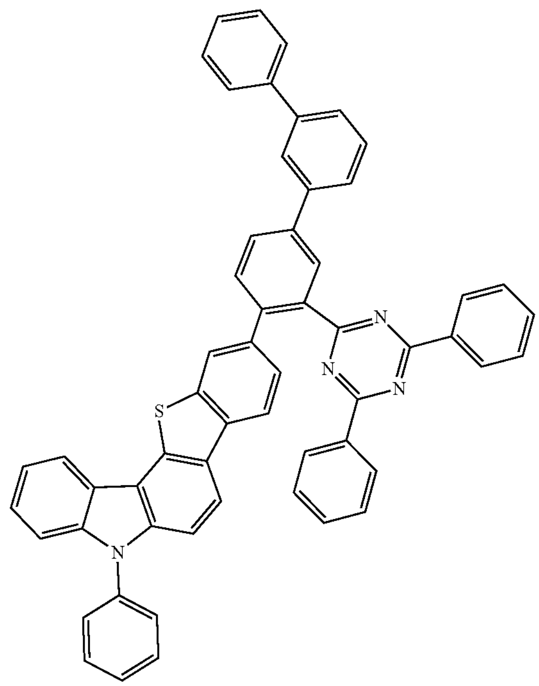
223
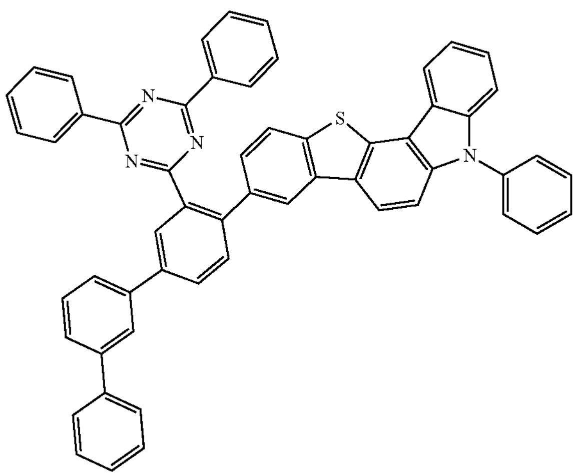
-continued
224
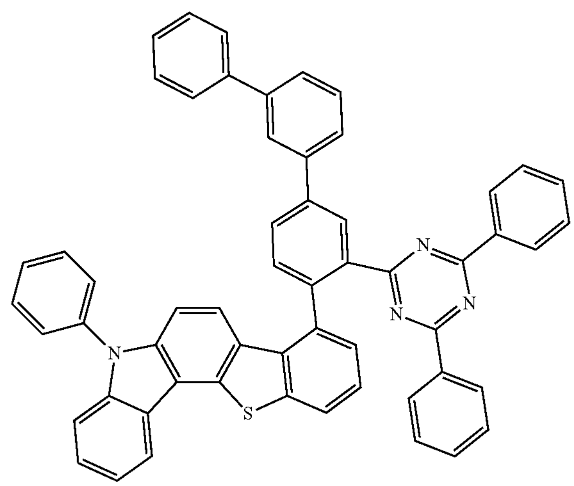
225
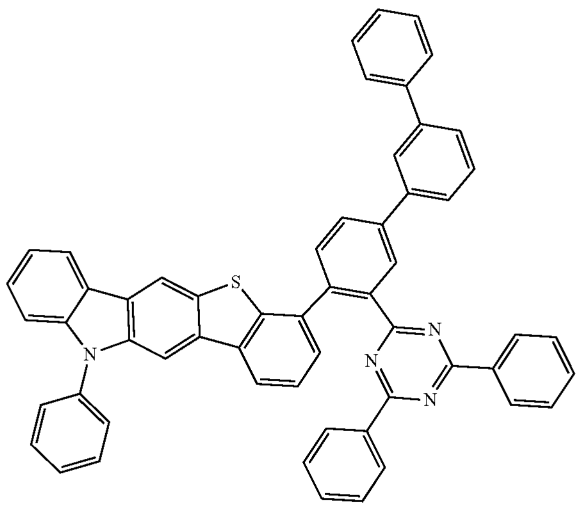
226
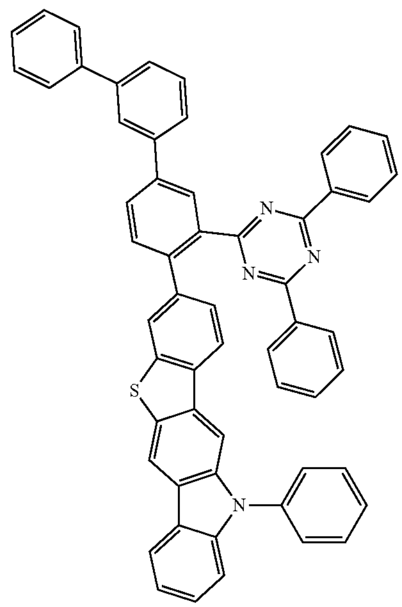

-continued
227
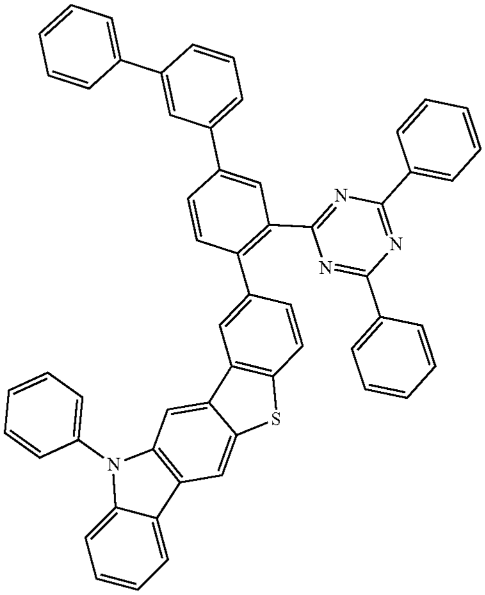
228
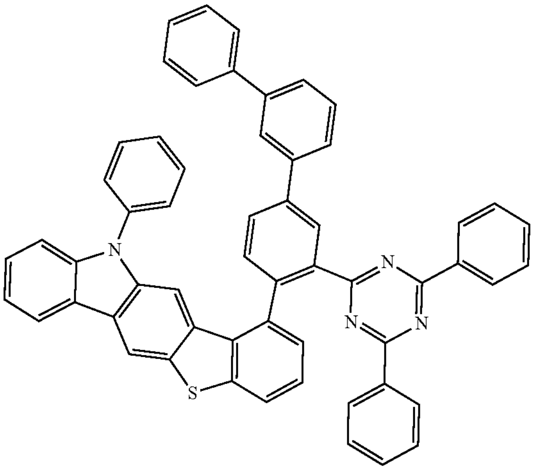
229
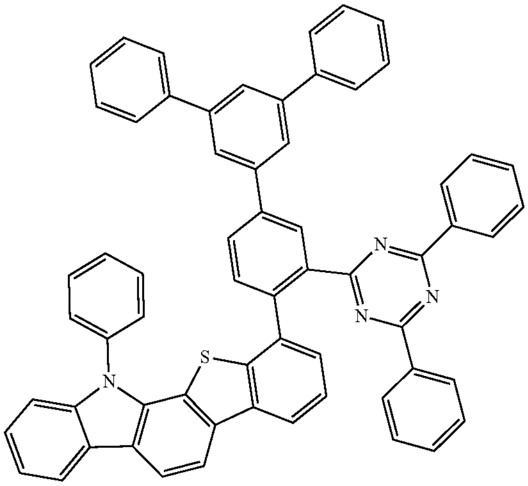
-continued
230
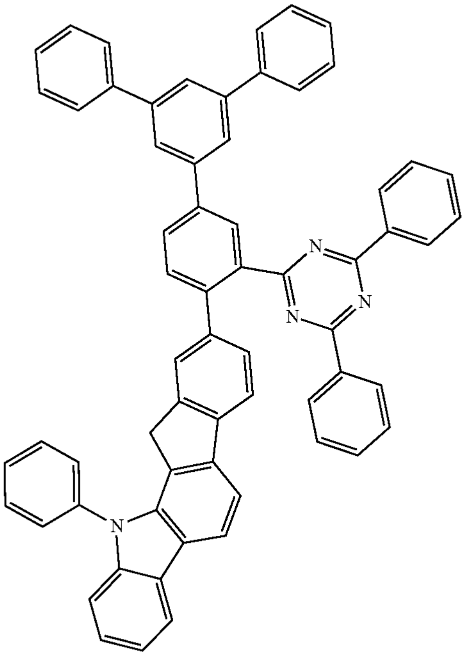
231
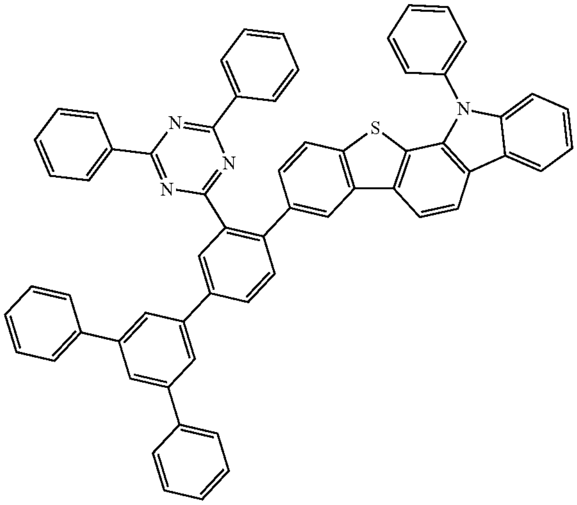

-continued
232
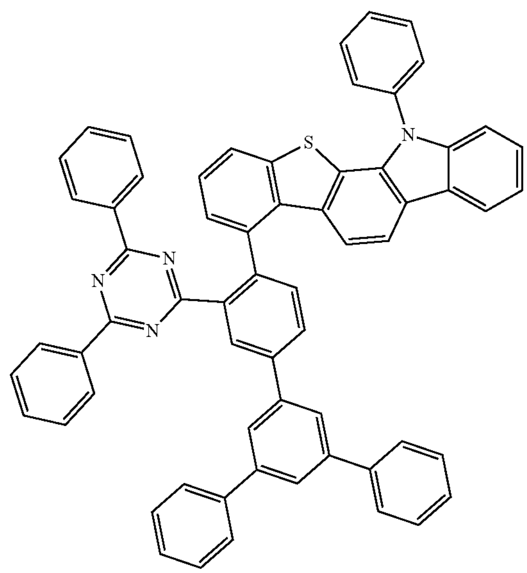
233
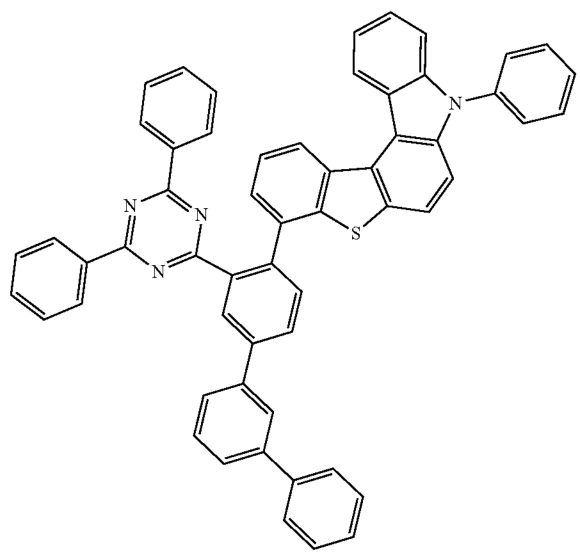
-continued
234
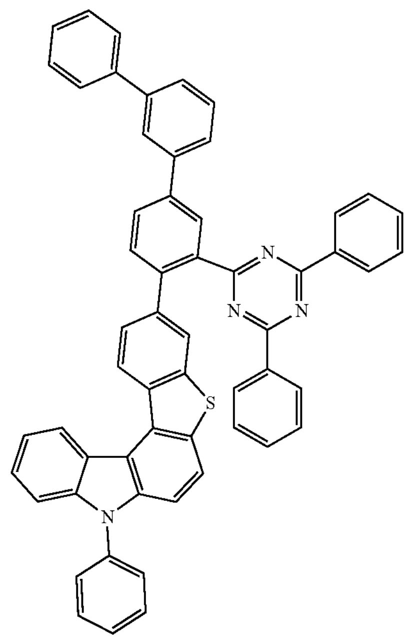
235
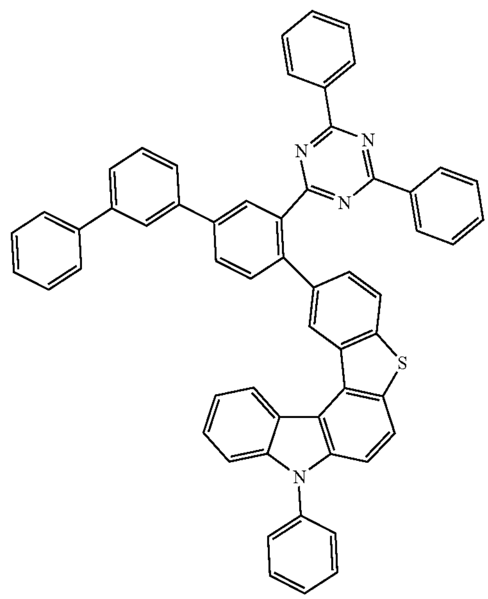

-continued
236
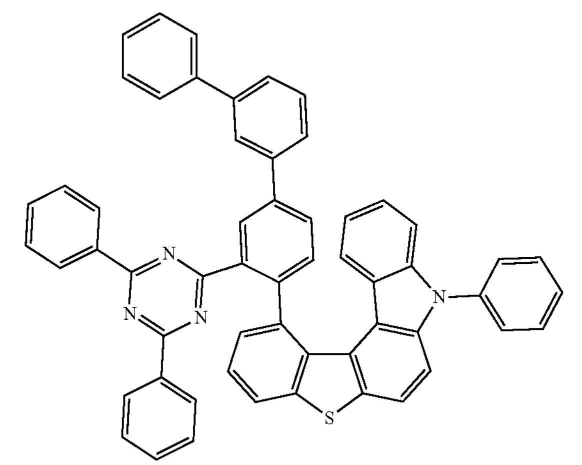
237
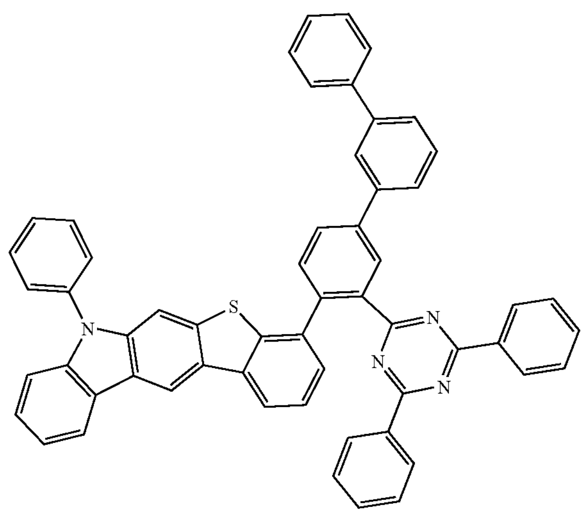
238
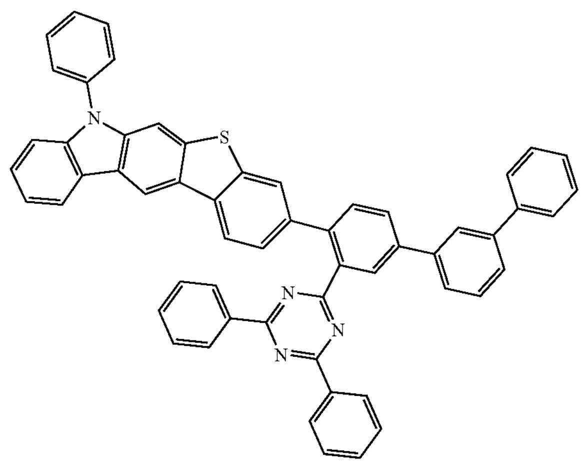
-continued
239
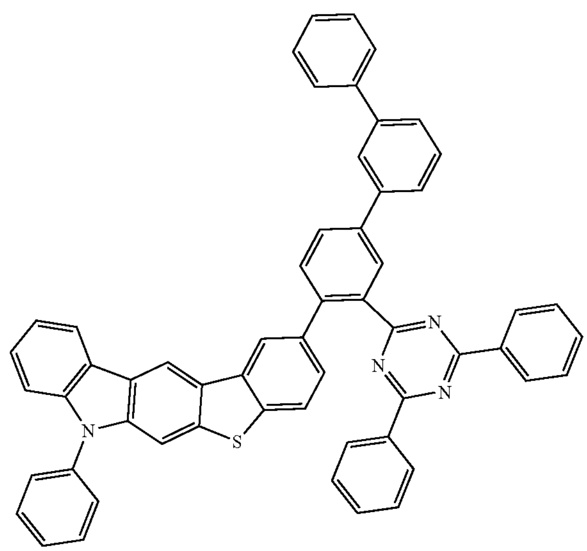
240
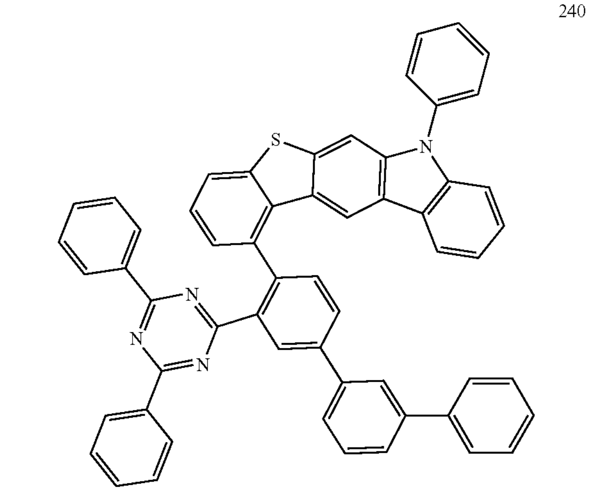
241
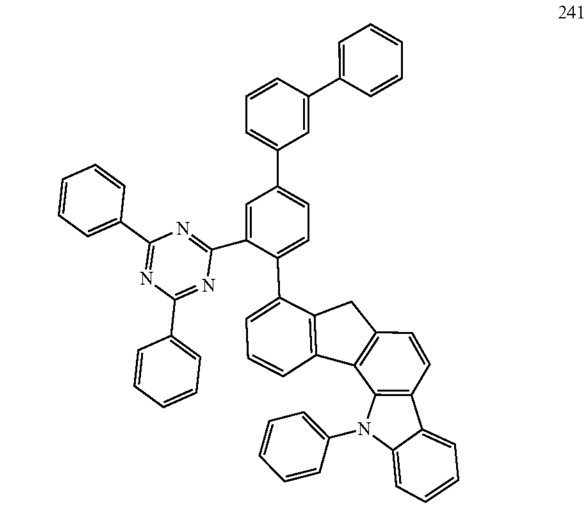

-continued
242
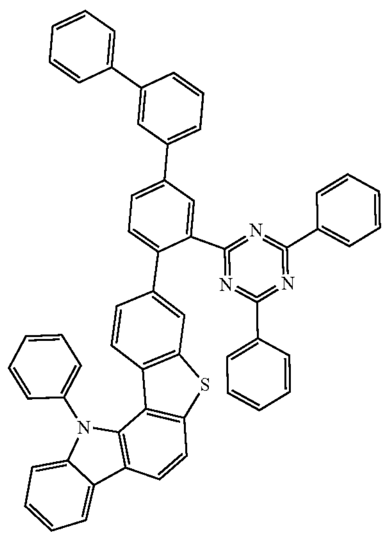
243
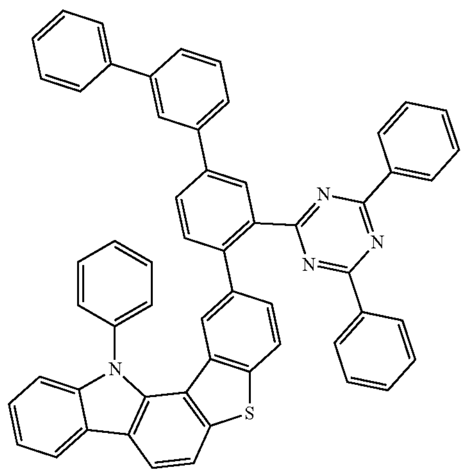
244
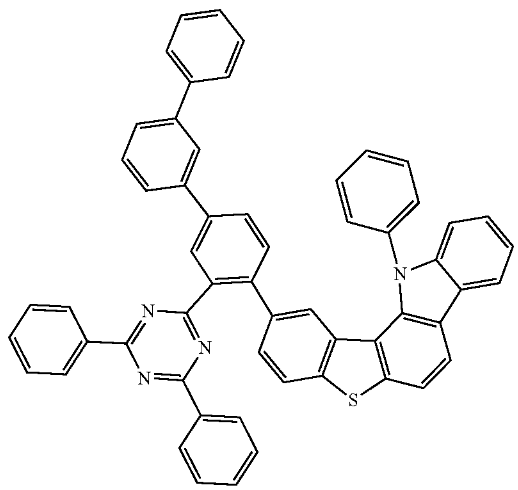
-continued
245
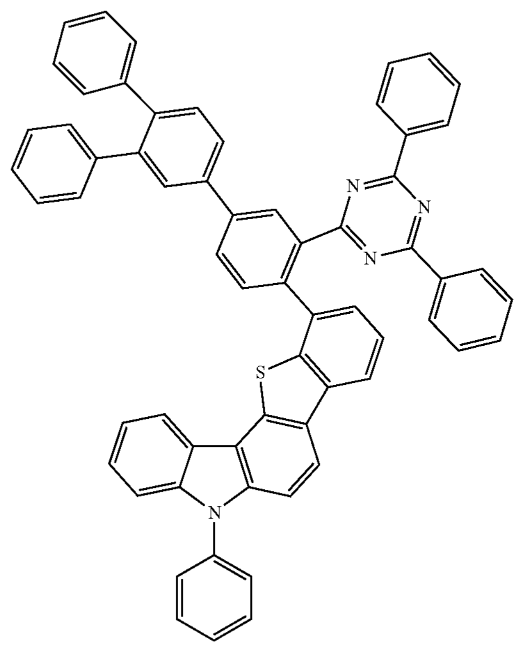
246
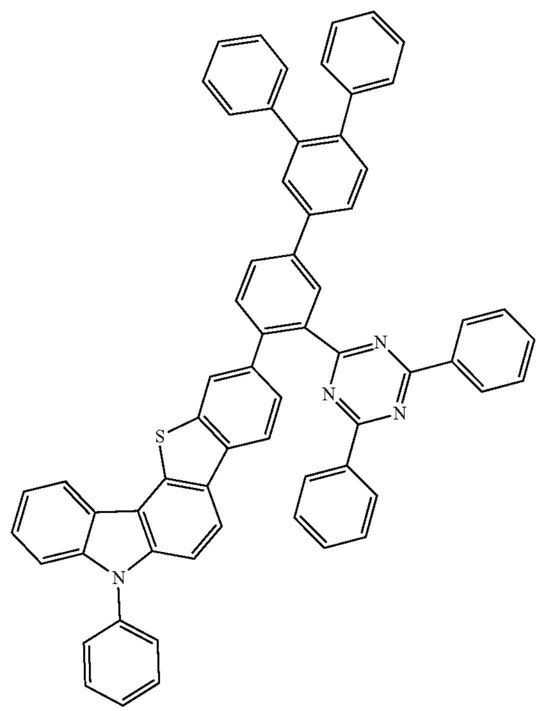

-continued
247
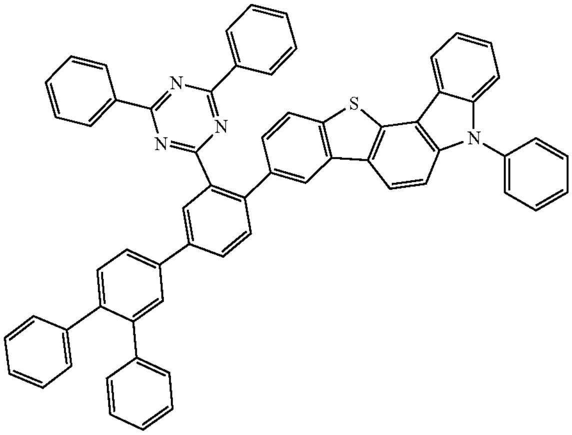
248
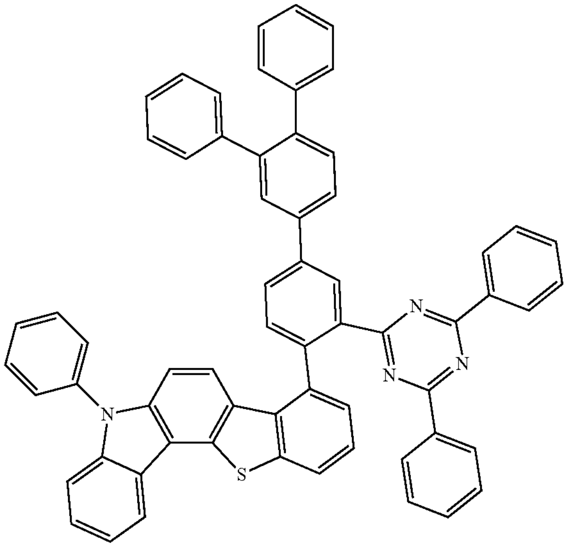
249
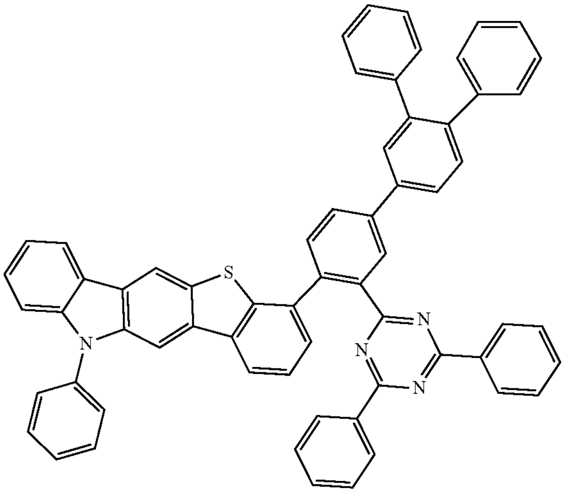
-continued
250
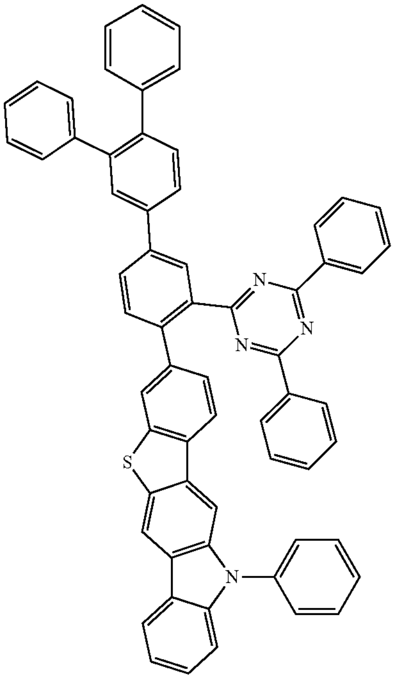
251
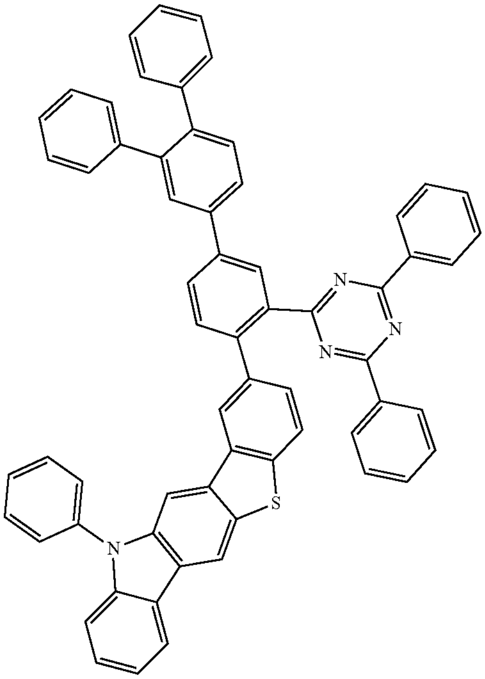

-continued
252
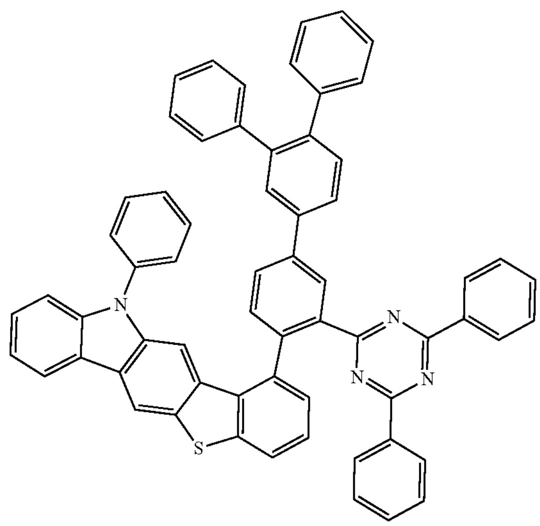
253
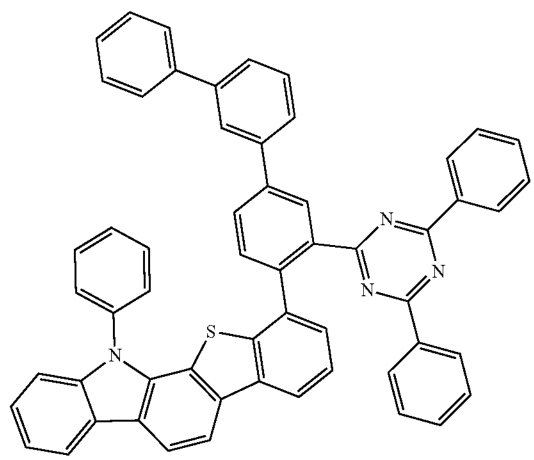
254
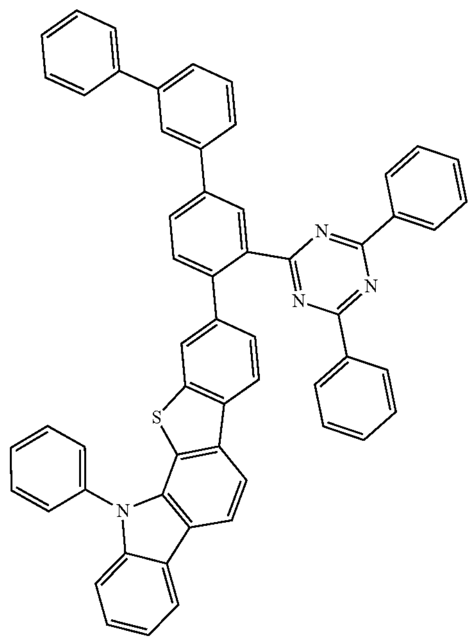
-continued
255
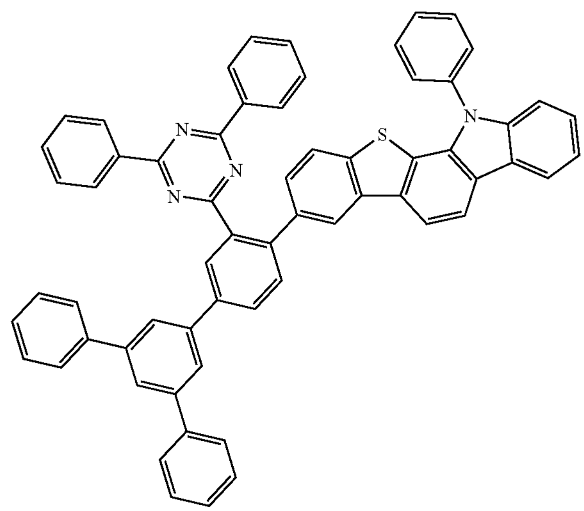
256
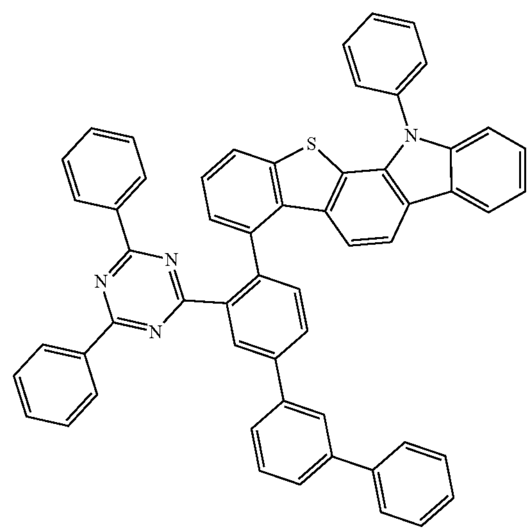

-continued
257
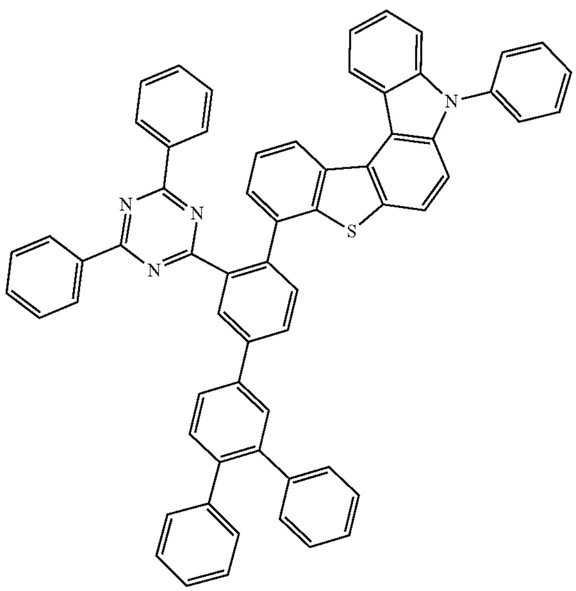
258
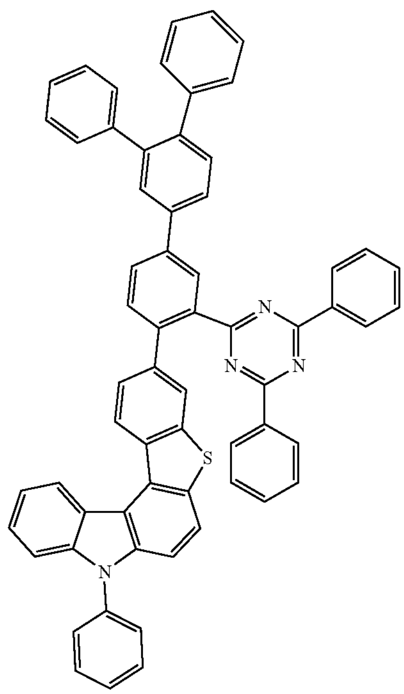
-continued
259
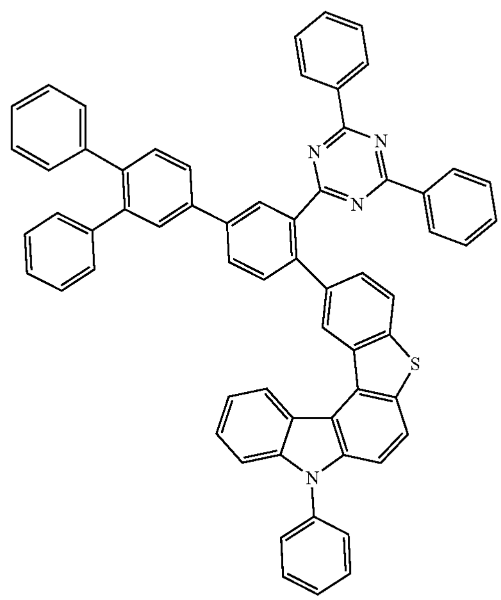
260
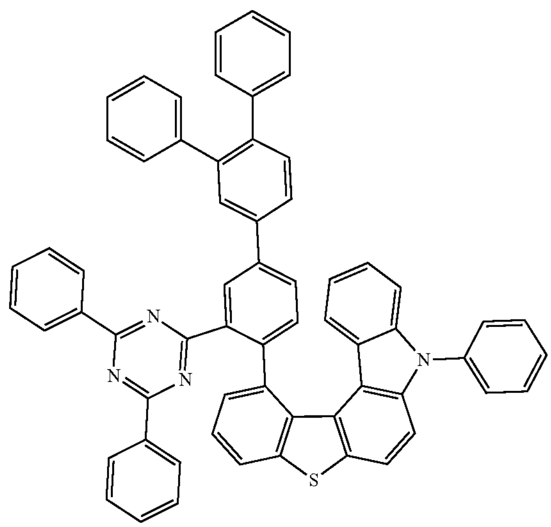

-continued
261
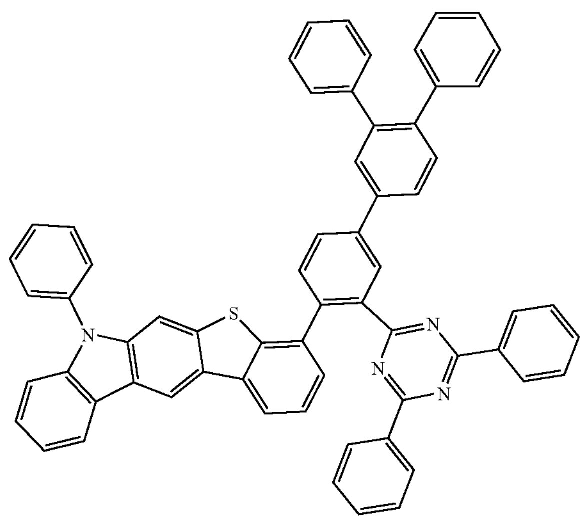
262
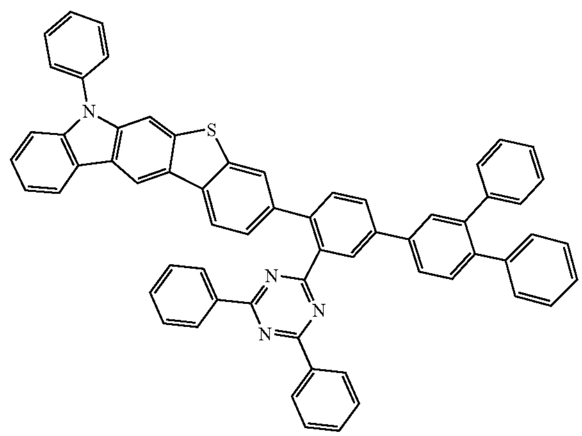
263
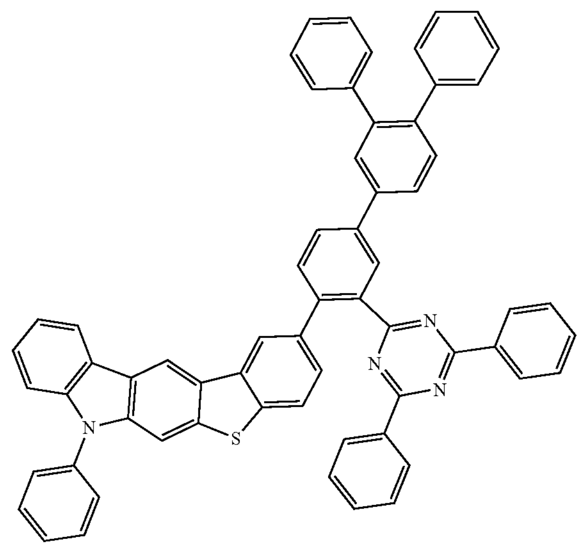
-continued
264
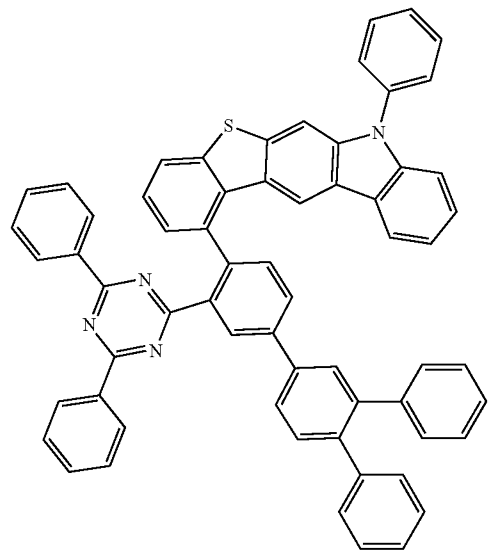
265
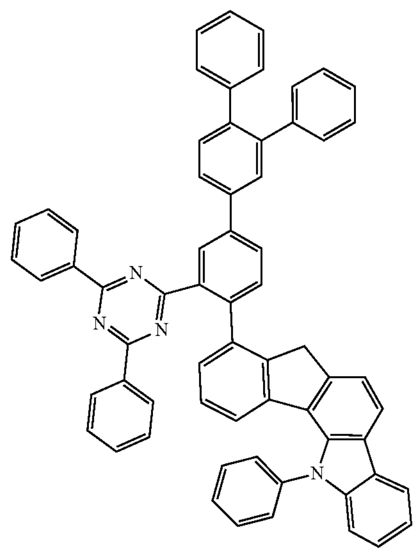

-continued
266
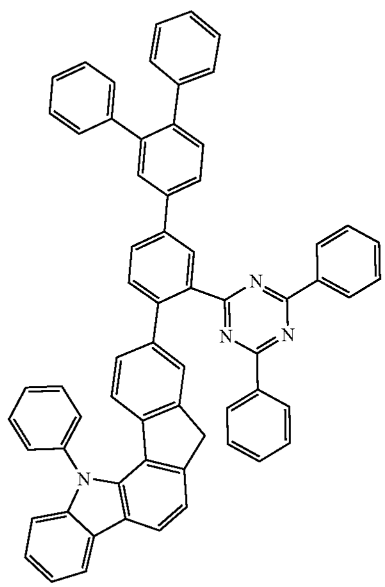
267
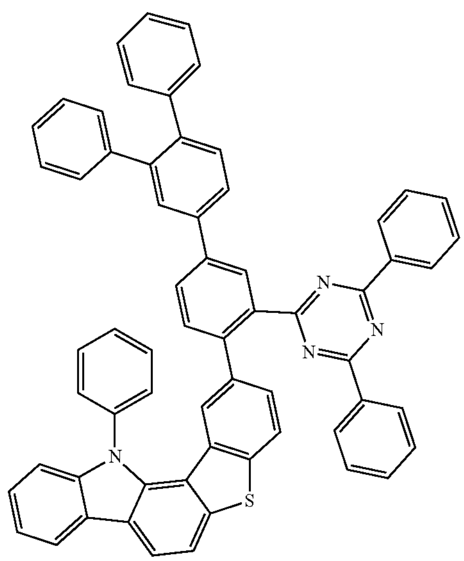
268
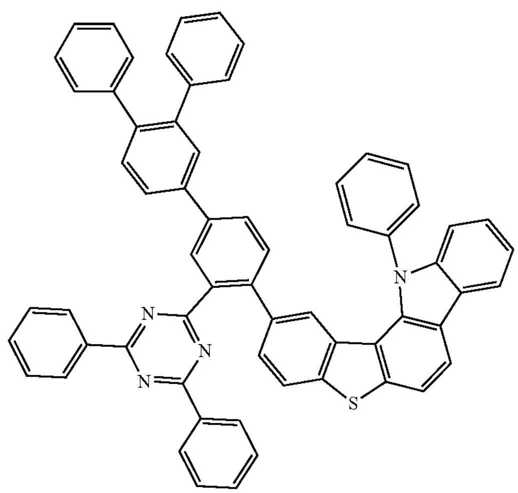
-continued
269
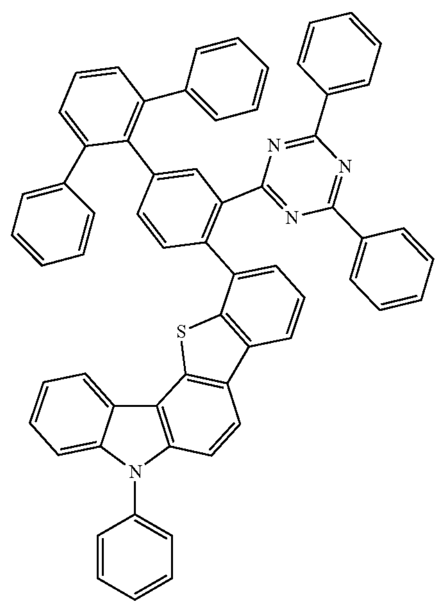
270
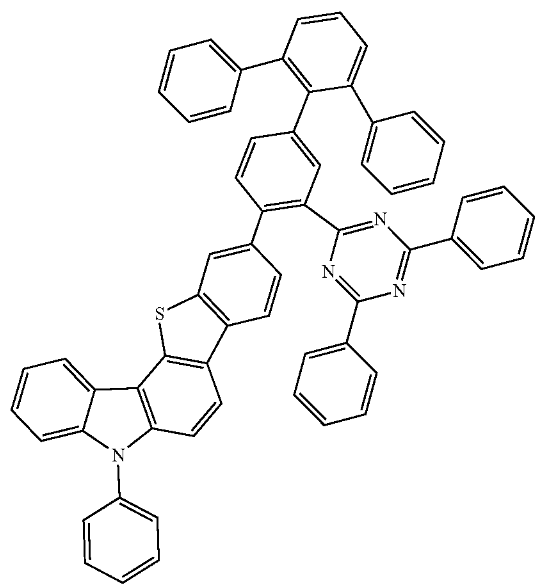
271
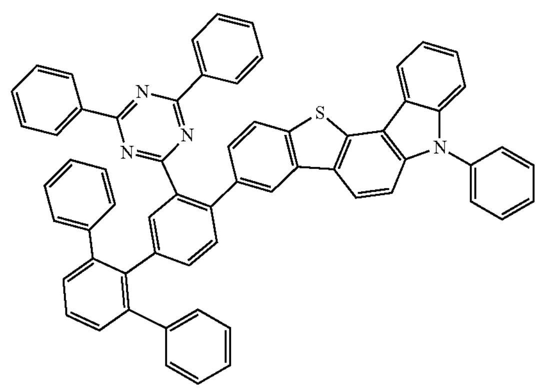

-continued
272
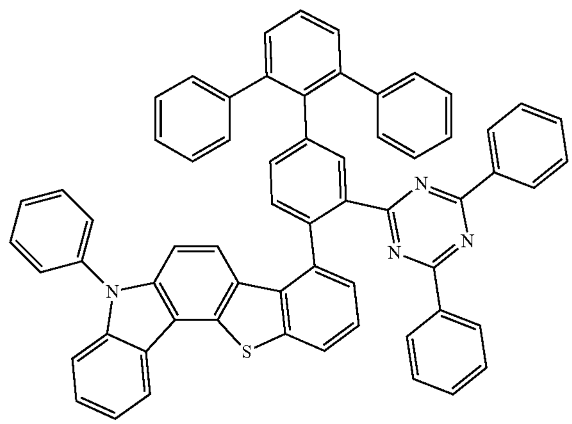
273
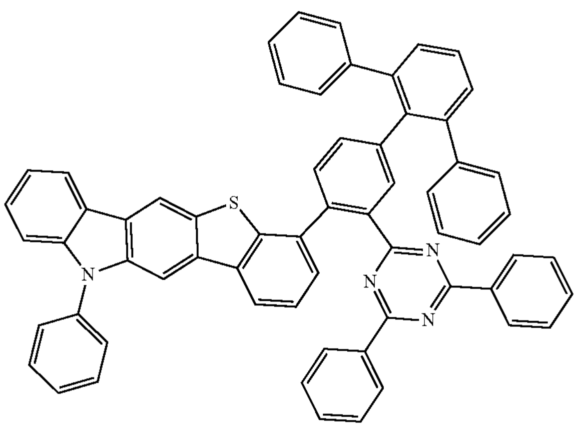
274
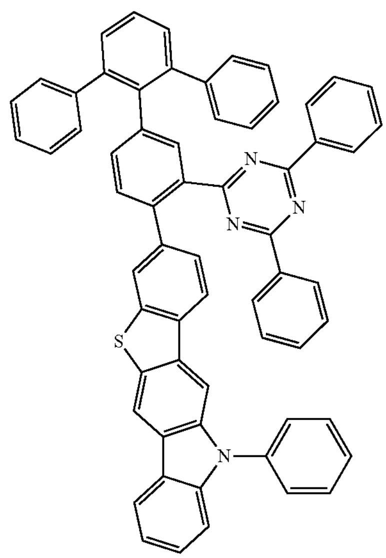
275
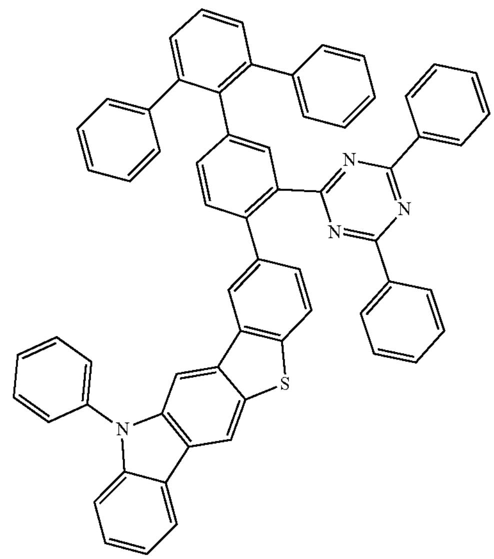
276
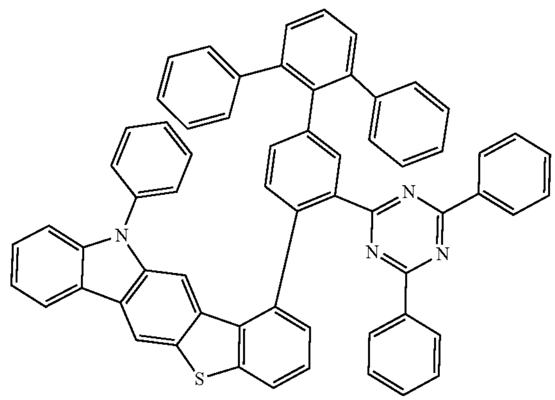
277
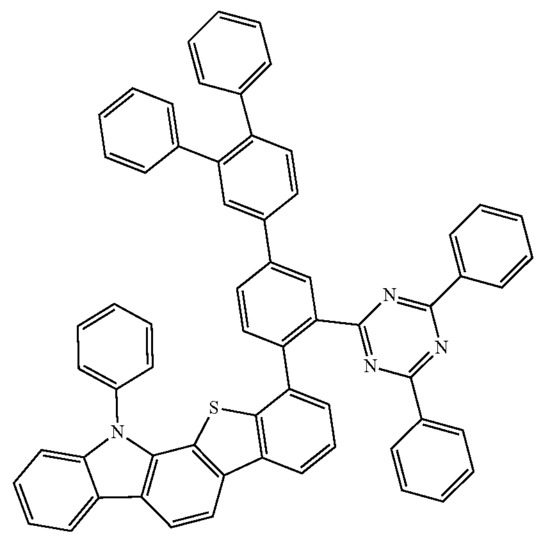

-continued
278
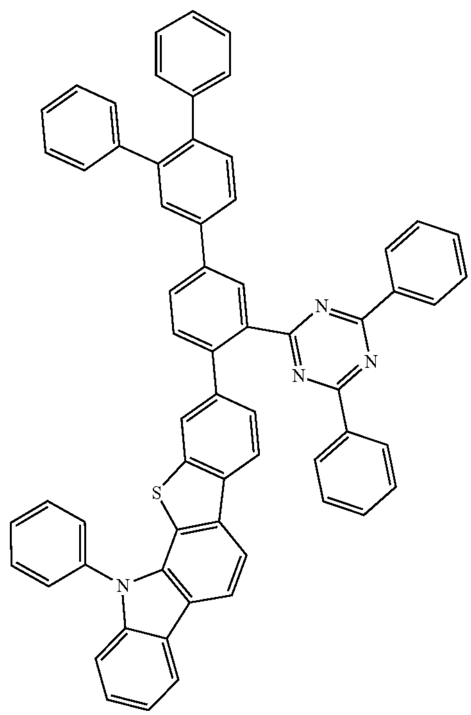
279
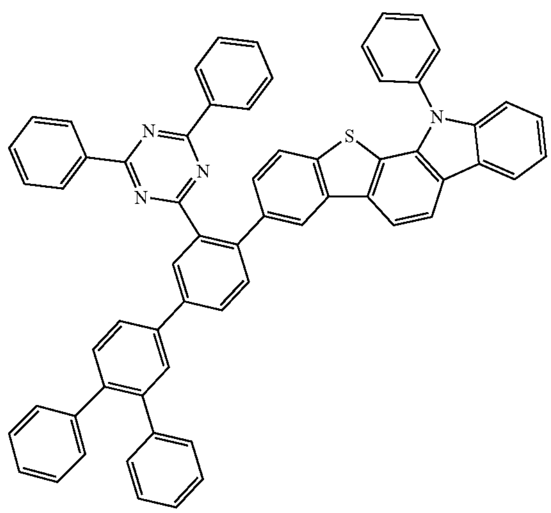
-continued
280
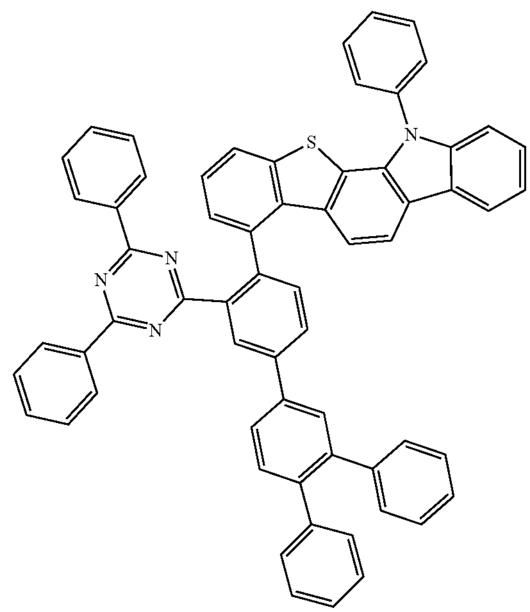
281
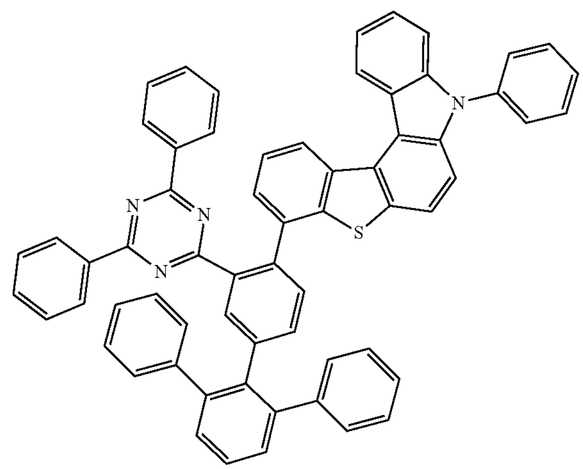

-continued
282
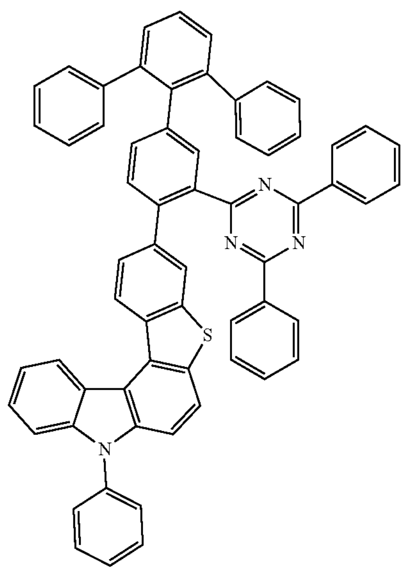
283
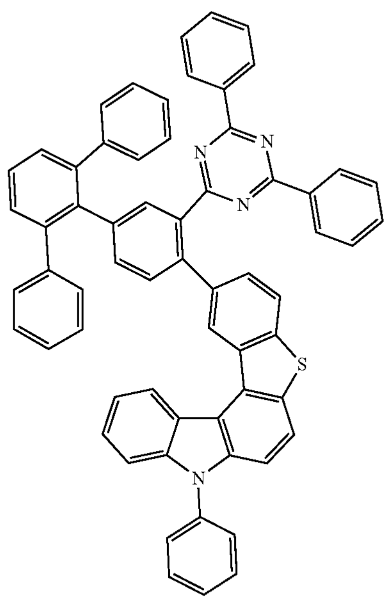
284
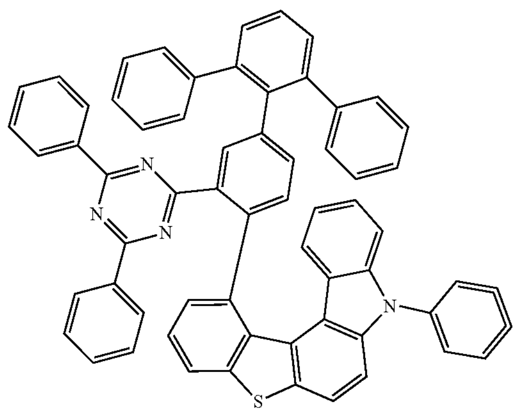
-continued
285
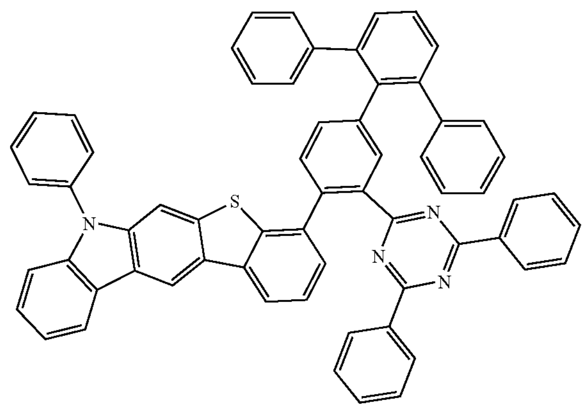
286
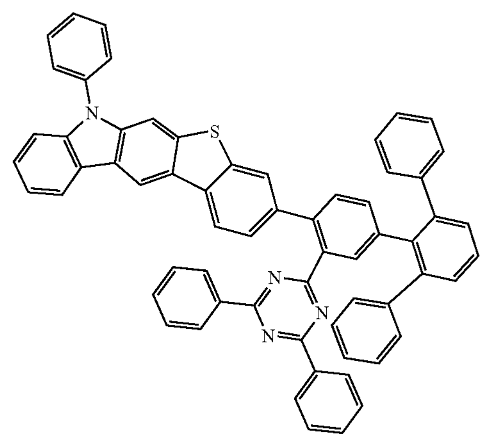
287
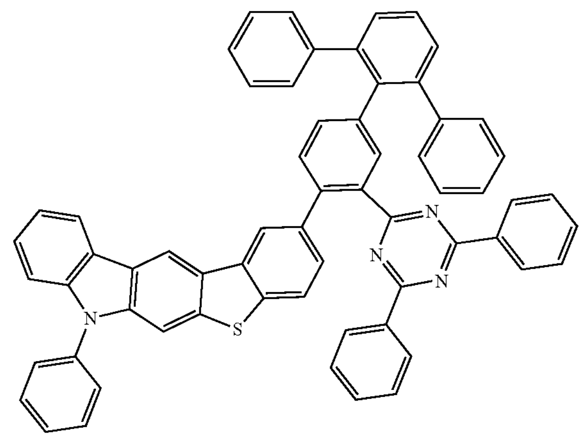

-continued
288
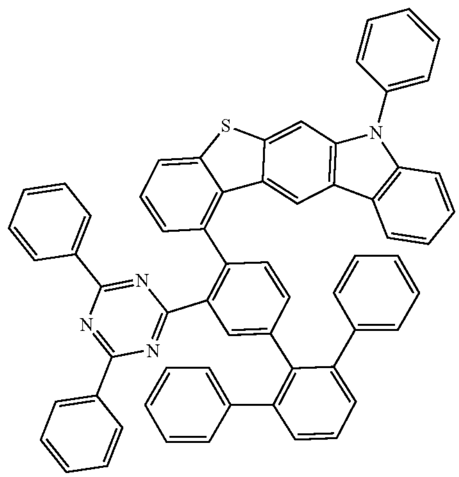
289
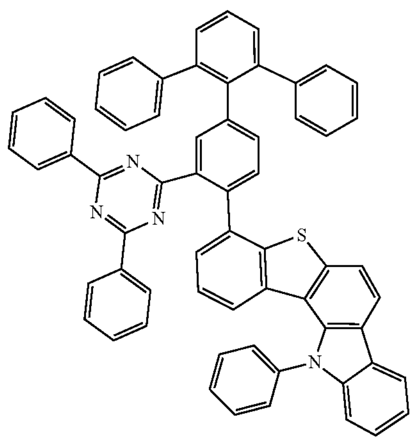
290
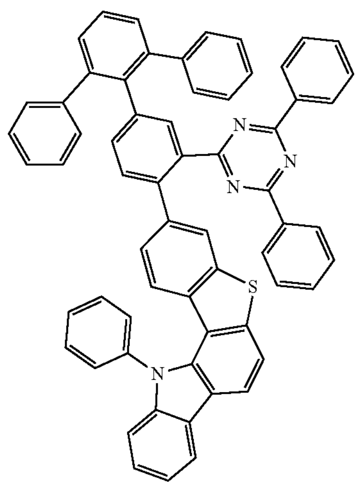
291
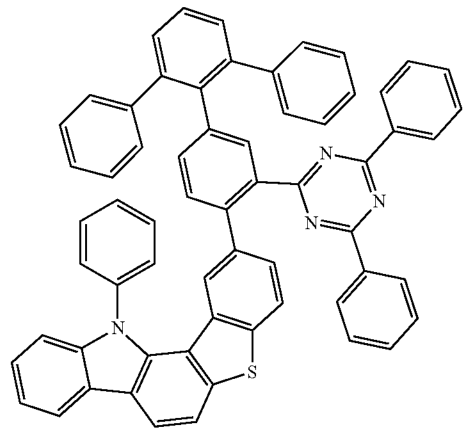
292
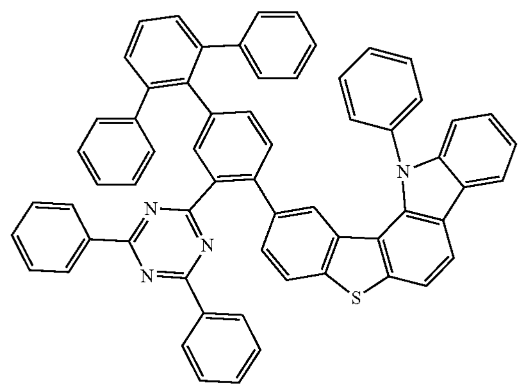
293
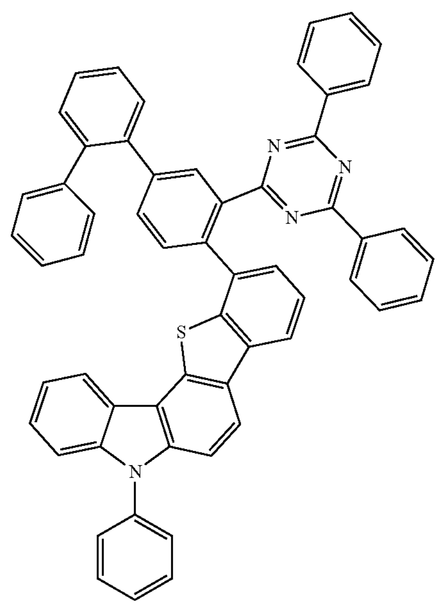

-continued
294
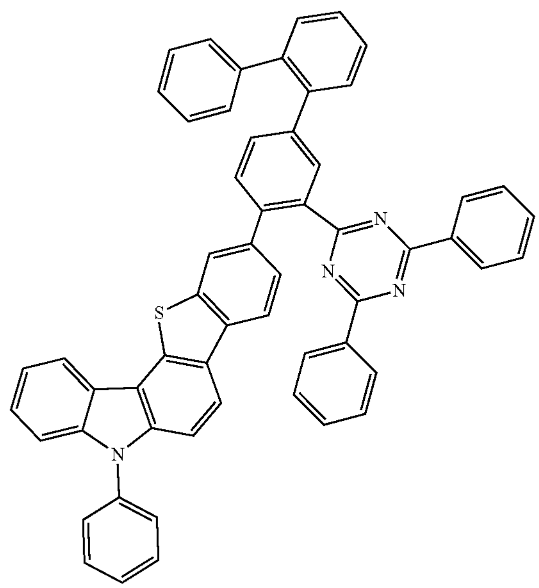
295
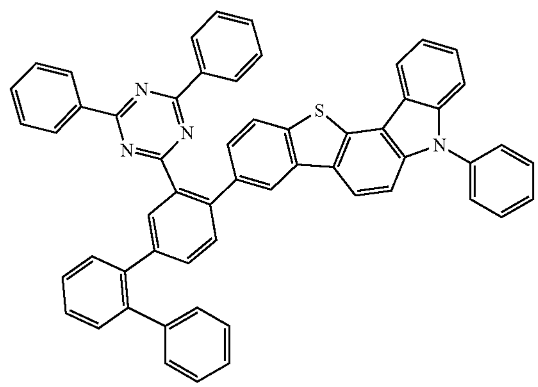
296
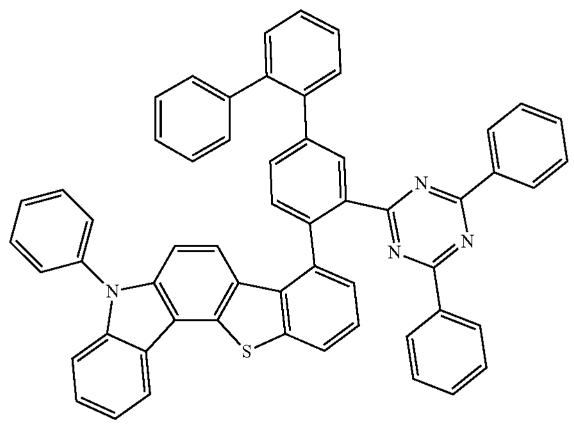
-continued
297
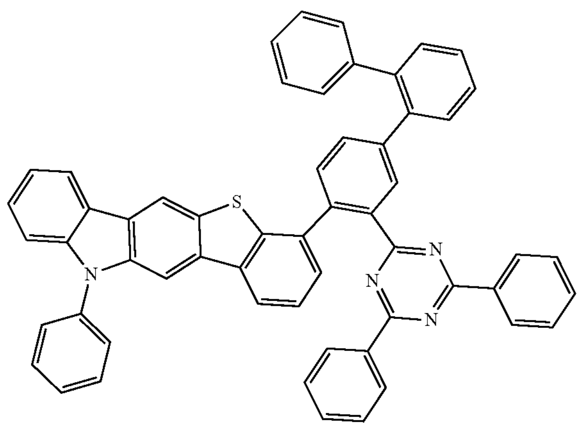
298
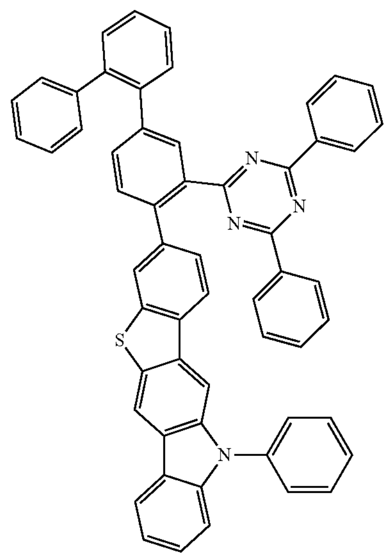
299
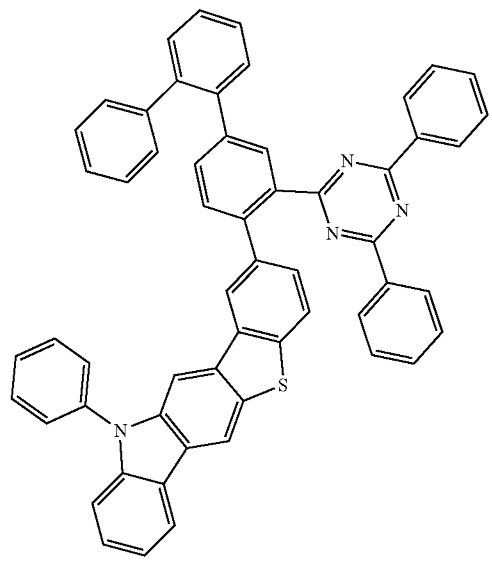

-continued
300
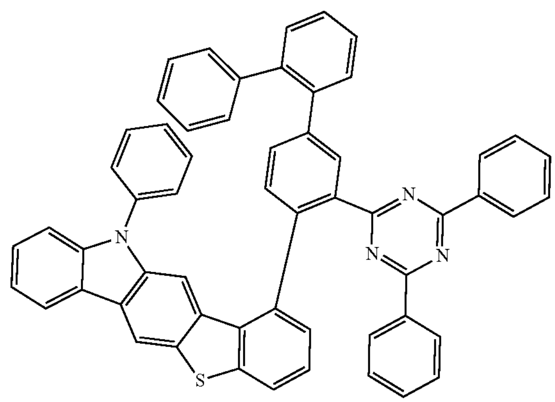
301
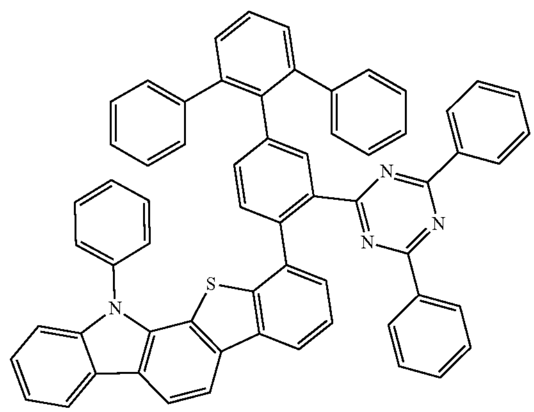
302
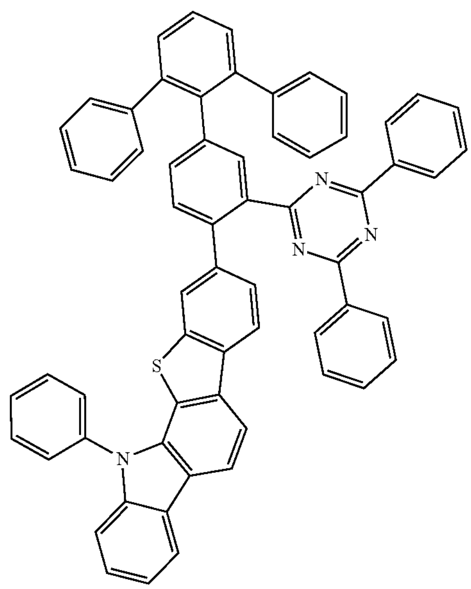
-continued
303
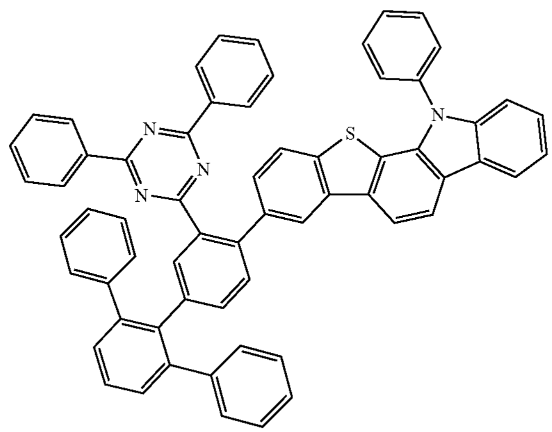
304
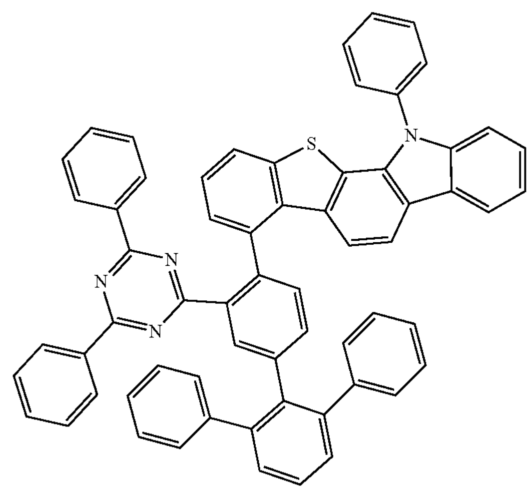
305
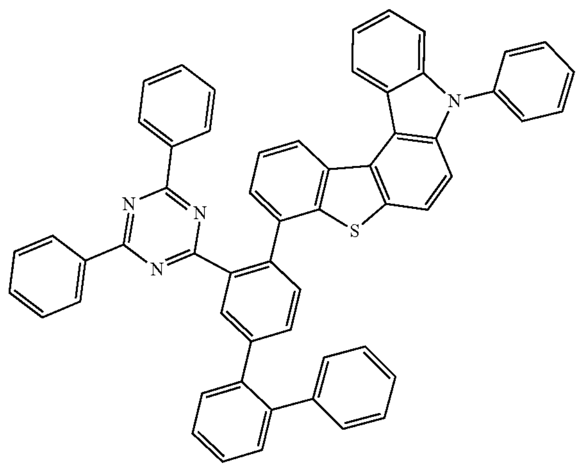

-continued
306
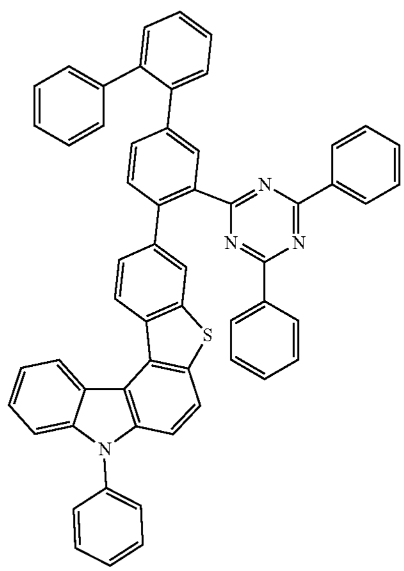
307
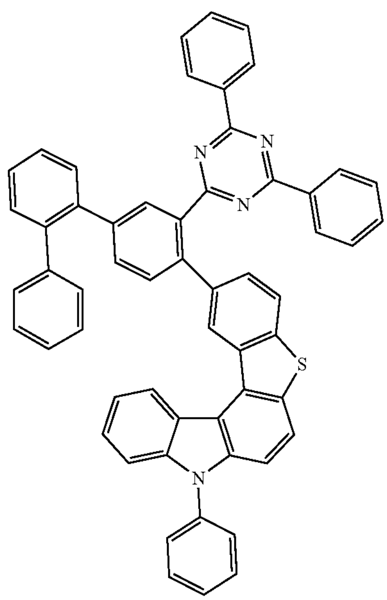
308
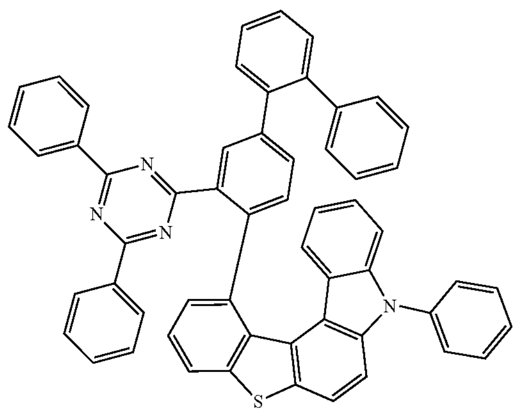
309
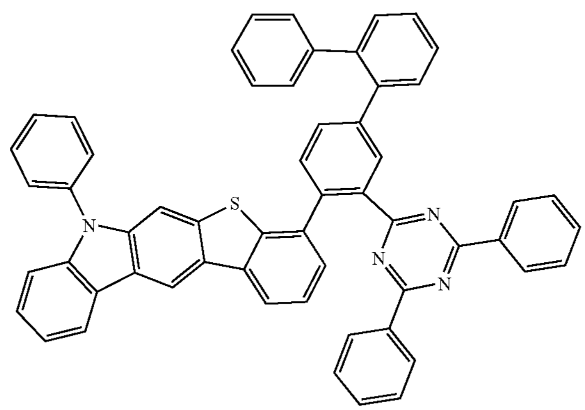
310
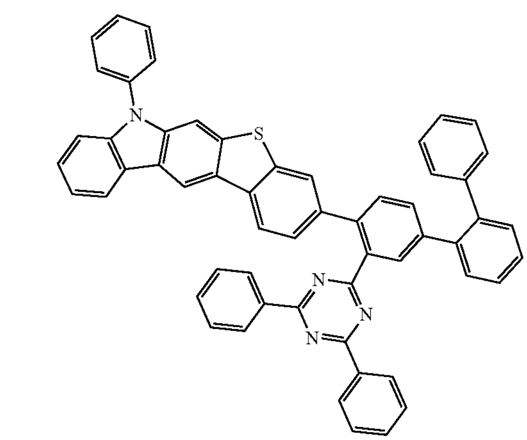
311
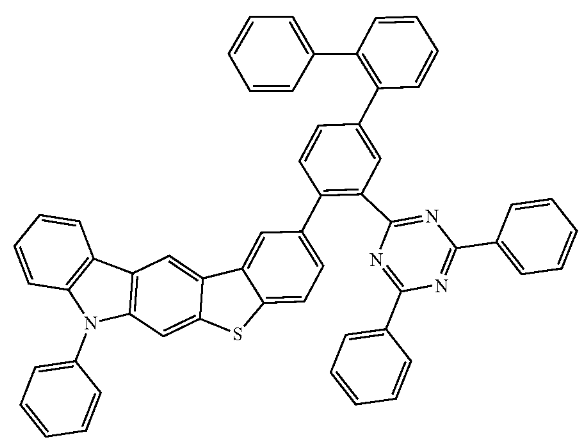

-continued
312
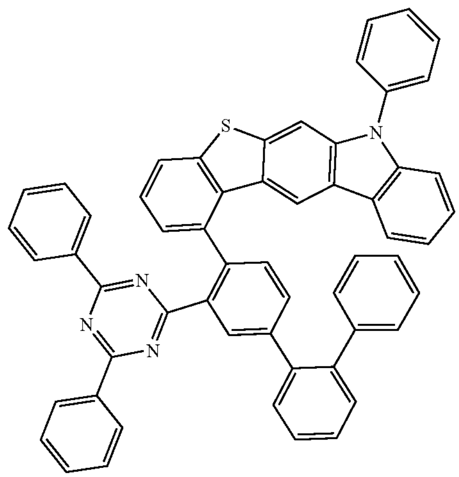
313
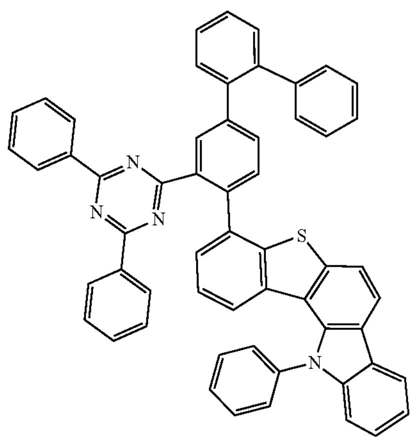
314
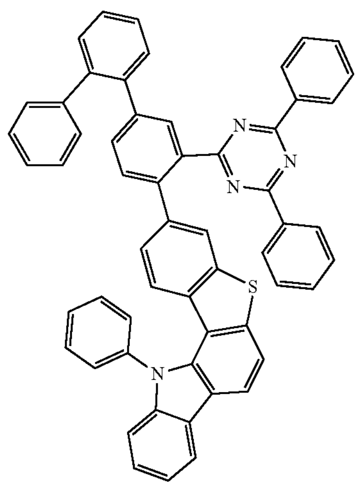
-continued
315
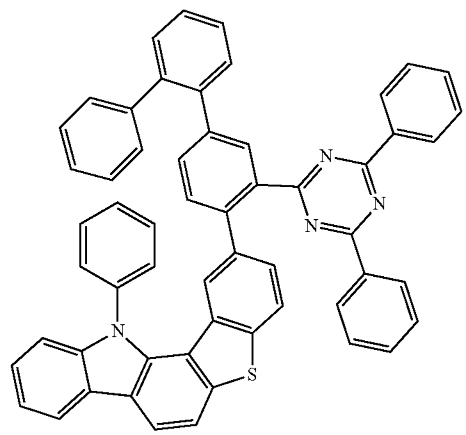
316
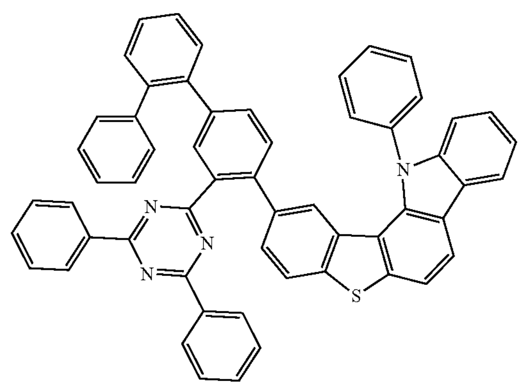
317
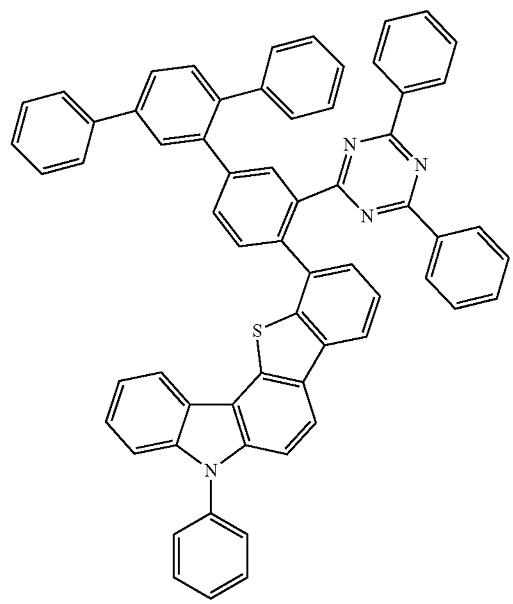

-continued
318
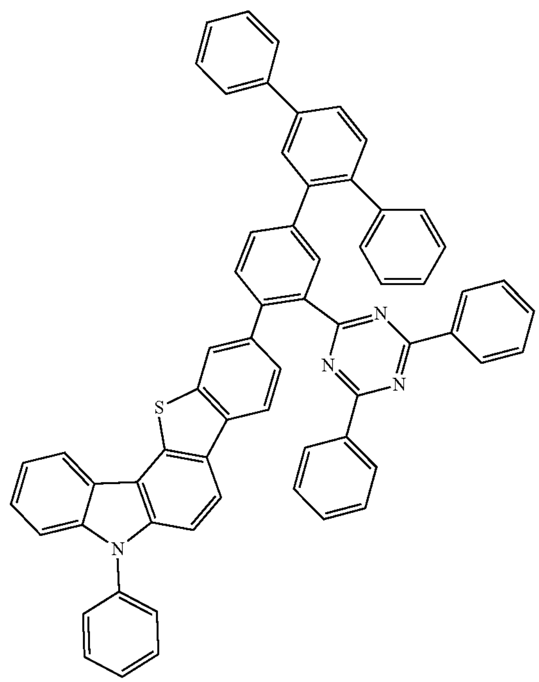
319
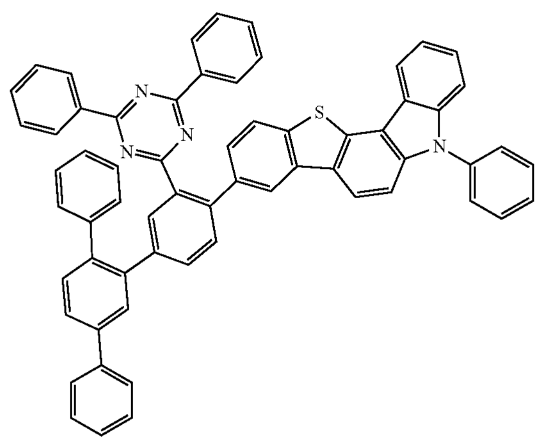
320
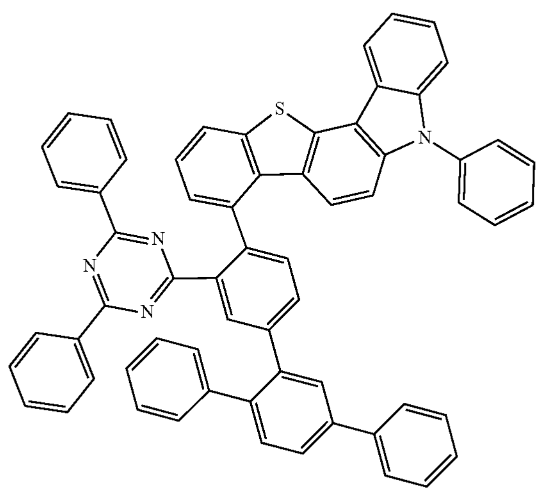
-continued
321
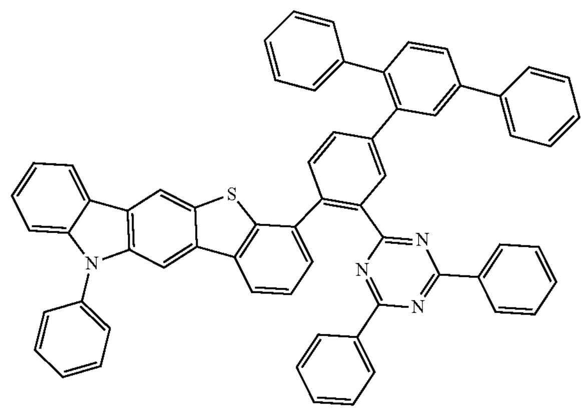
322
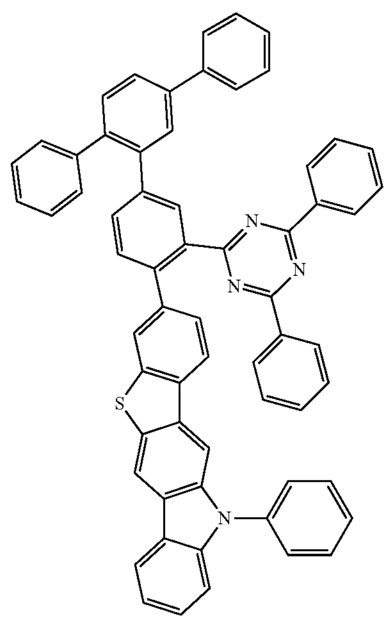

-continued
323
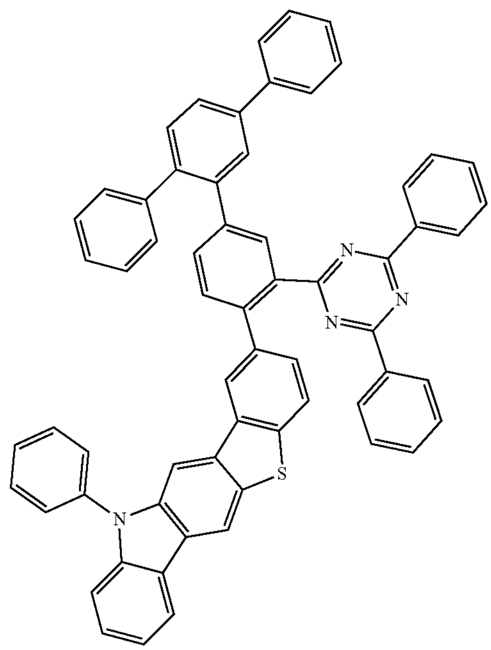
324
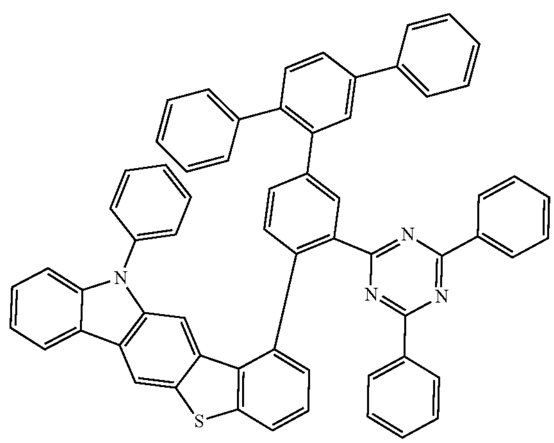
325
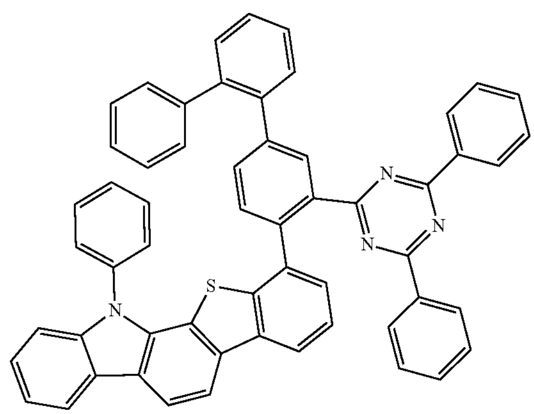
-continued
326
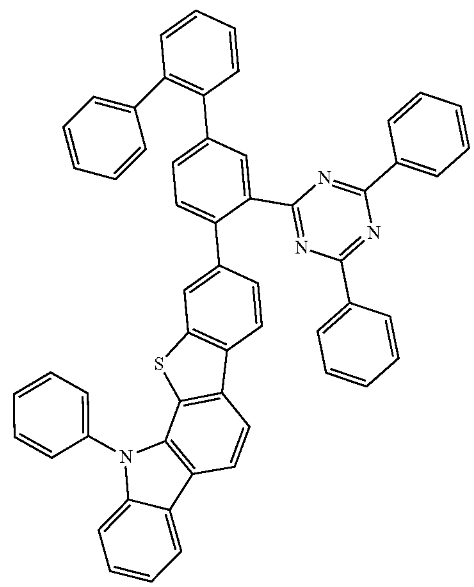
327
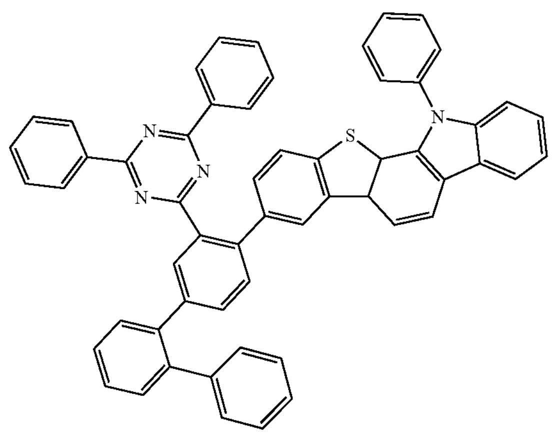
328
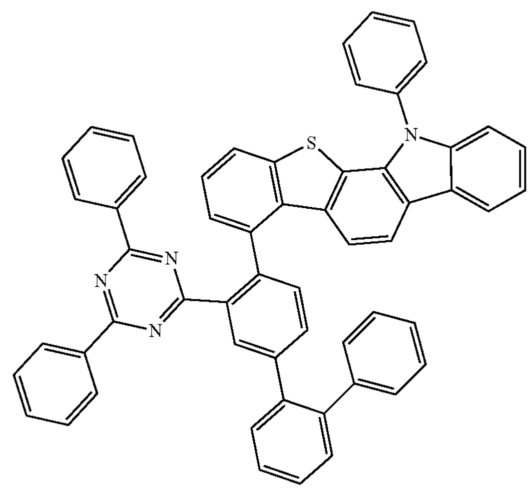

-continued
329
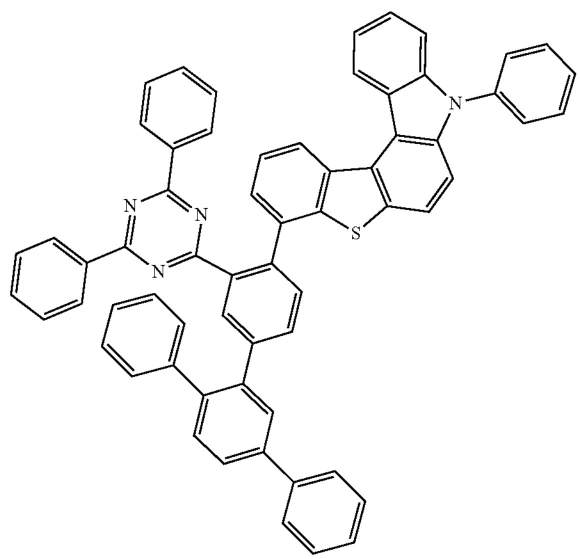
330
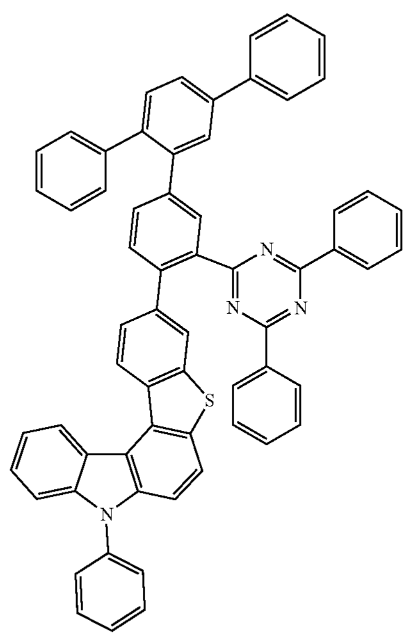
-continued
331
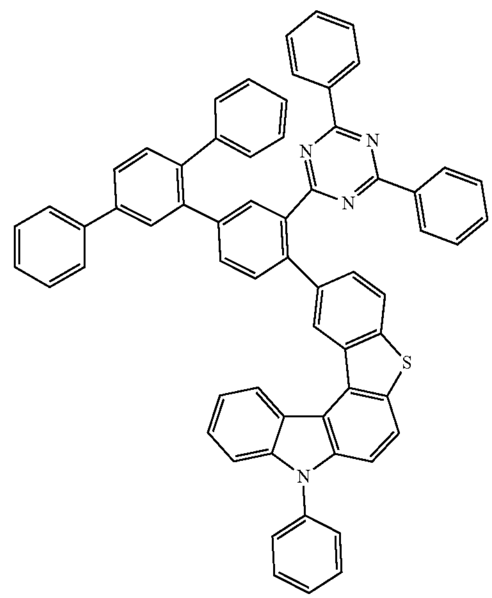
332
333
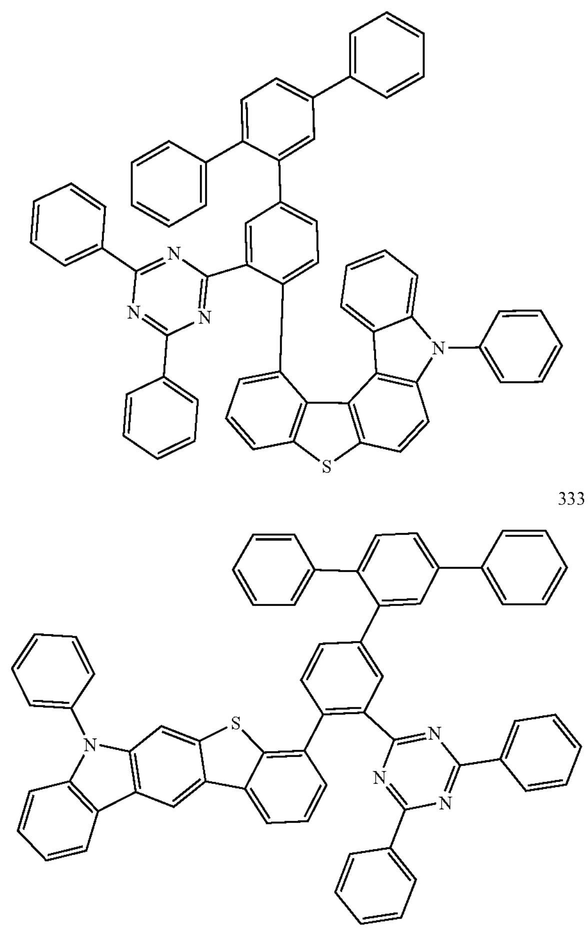

-continued
334
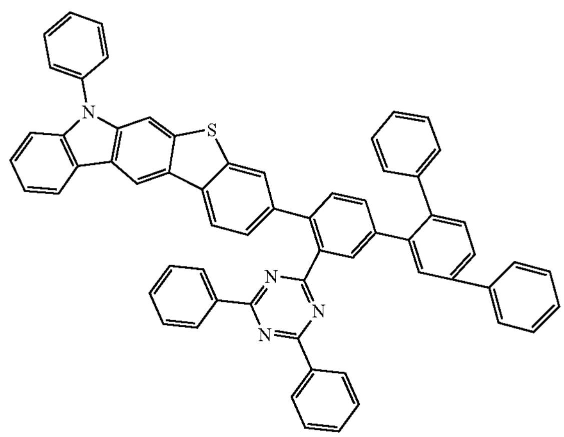
335
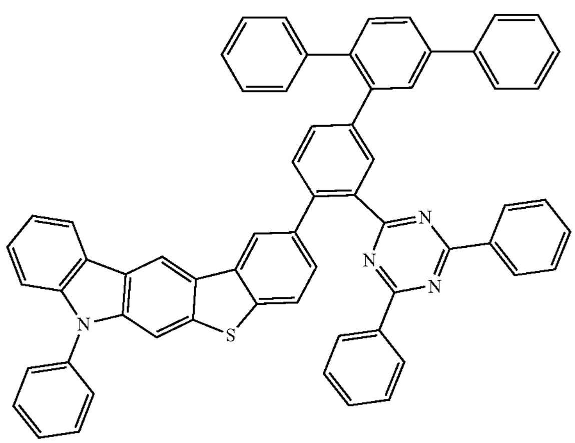
336
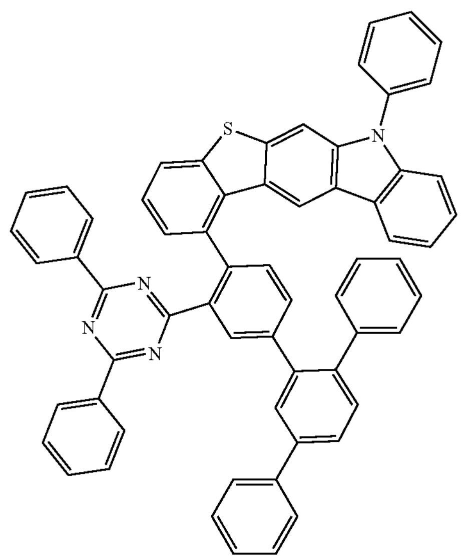
-continued
337
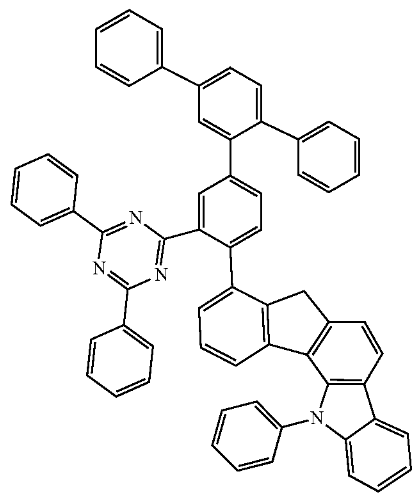
338
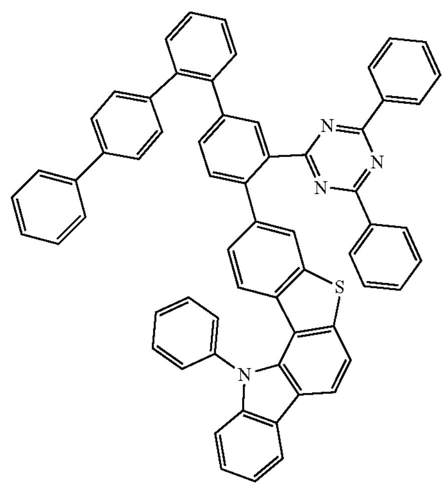
339
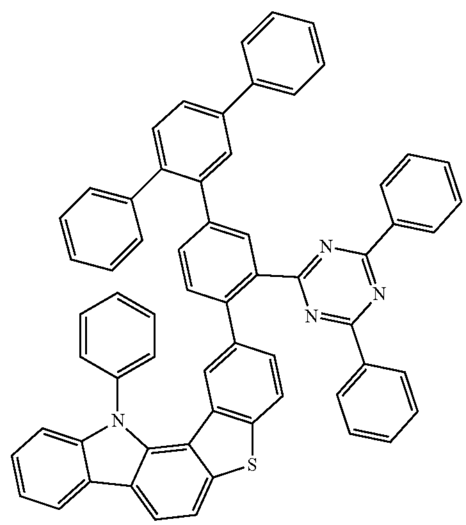

-continued
340
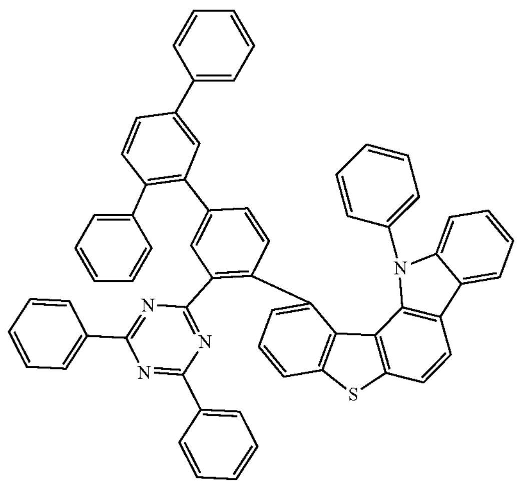
341
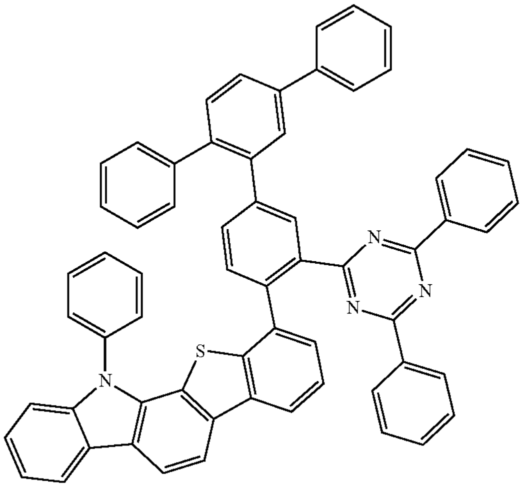
-continued
342
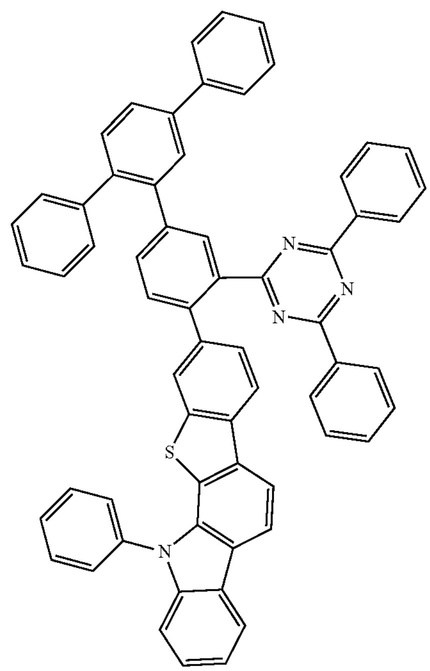
343
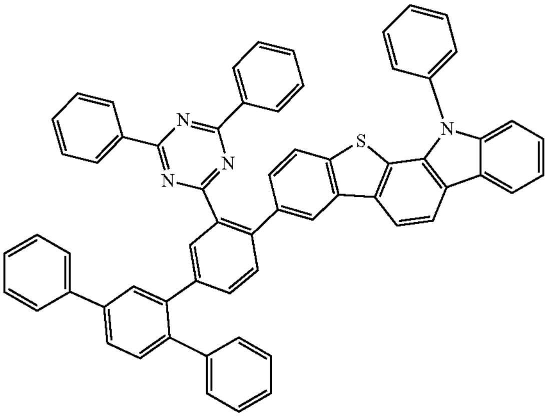

-continued
344
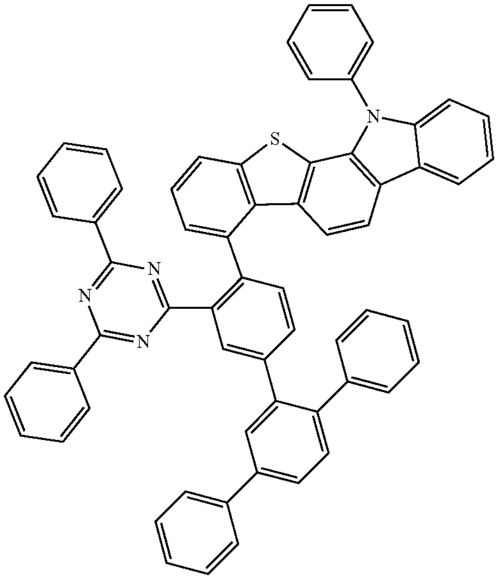
345
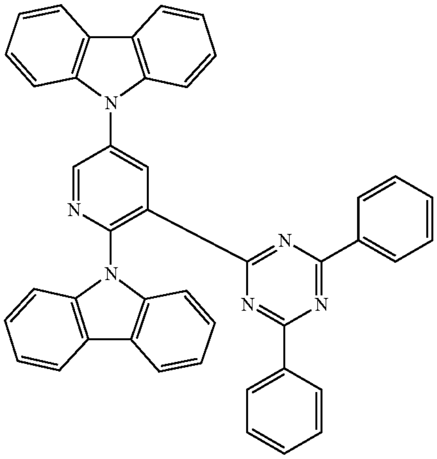
346
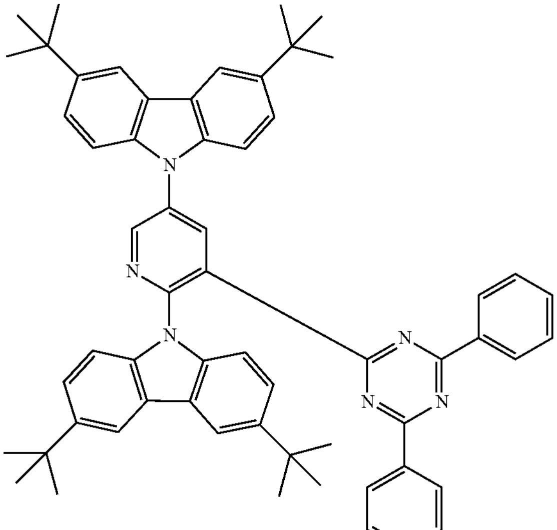
-continued
347
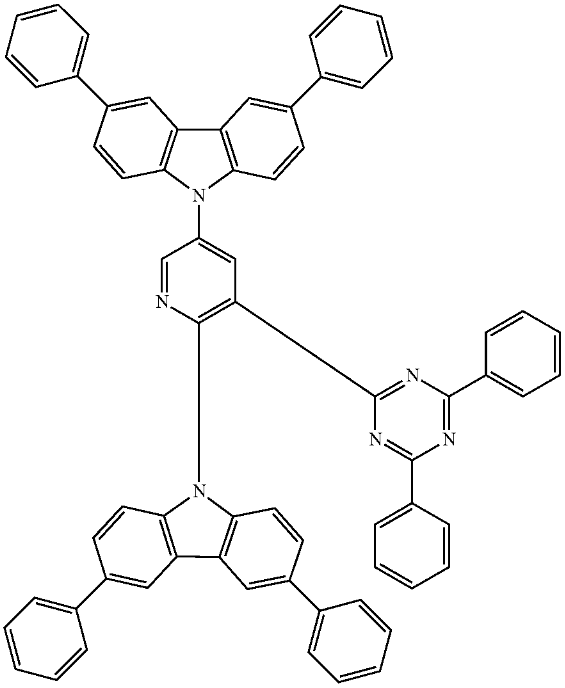
348
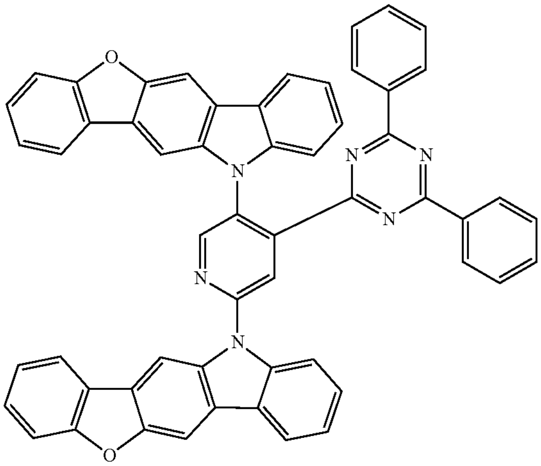
349
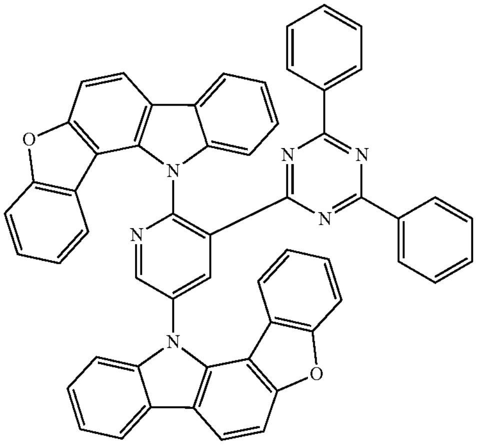

-continued
350
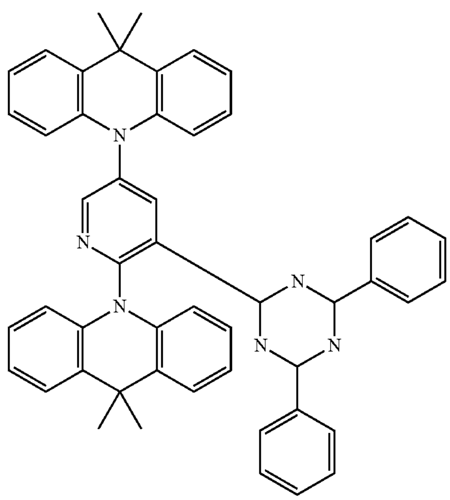
351
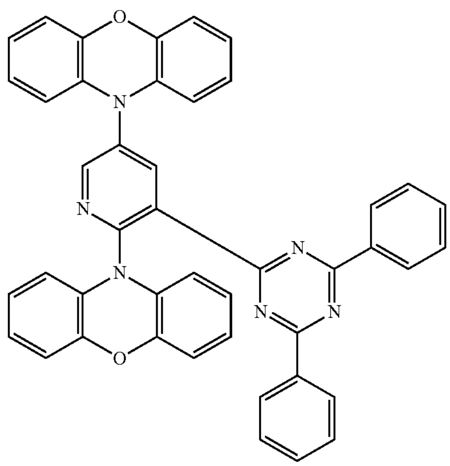
352
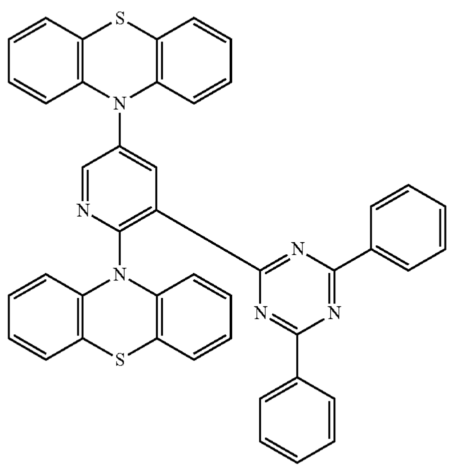
-continued
353
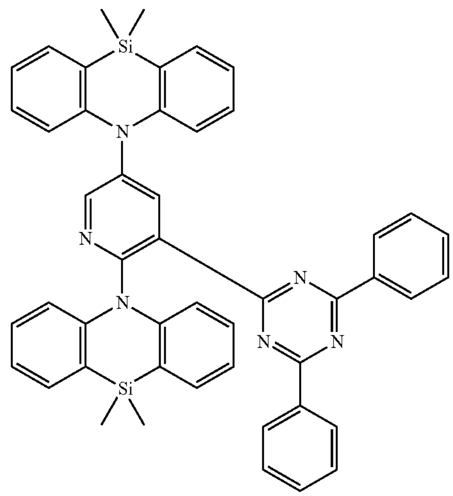
354
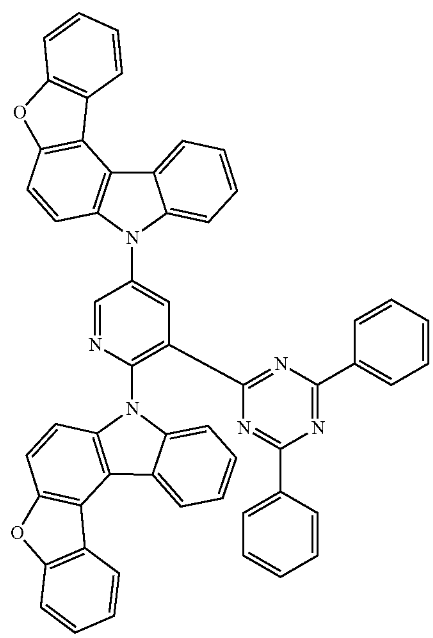
355
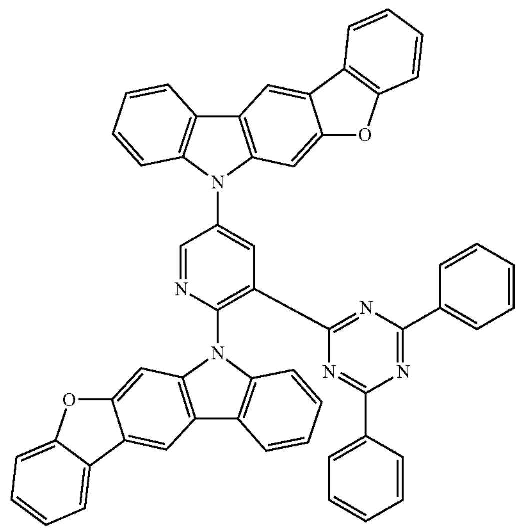

-continued
356
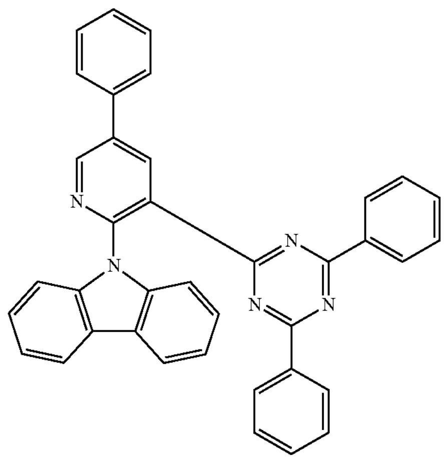
357
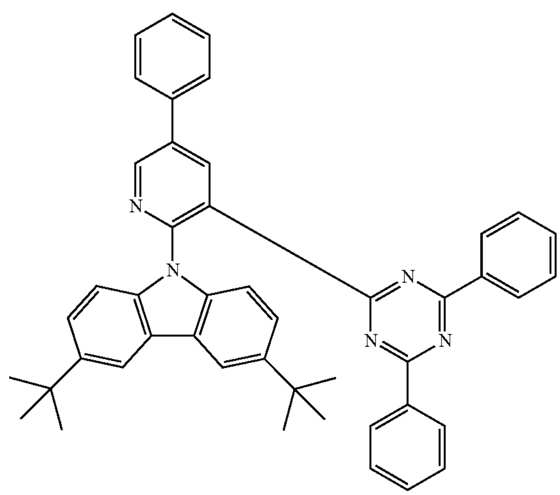
358
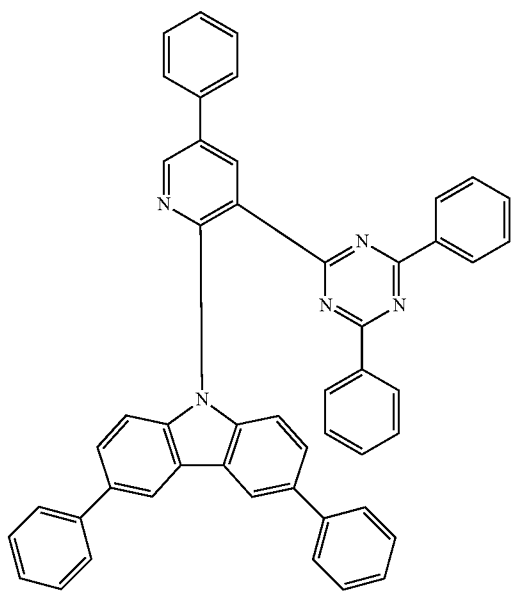
-continued
359
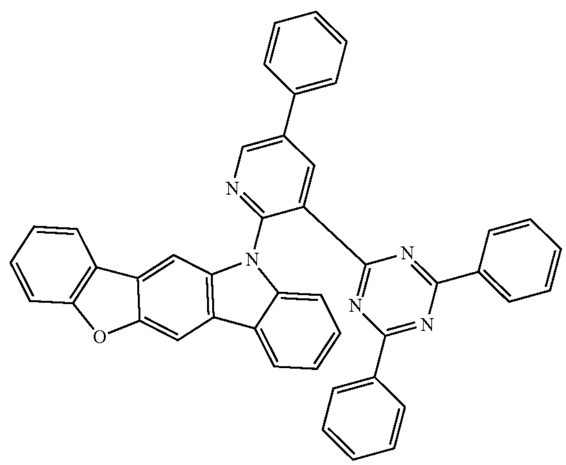
360
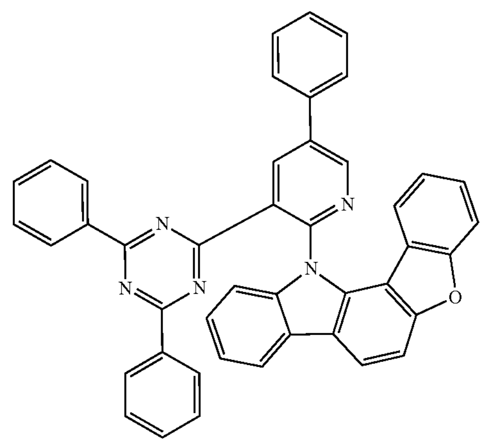
361
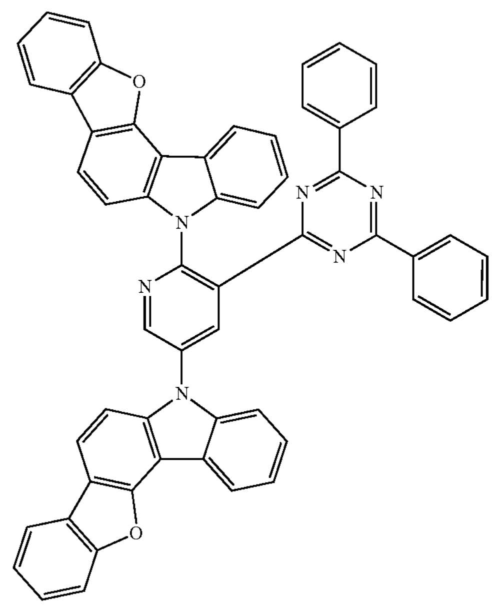

-continued
362
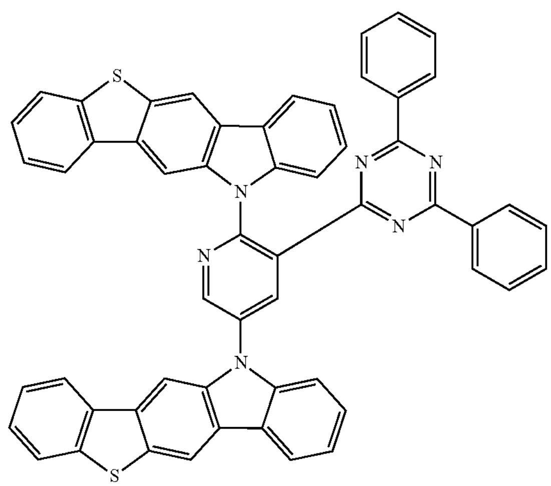
363
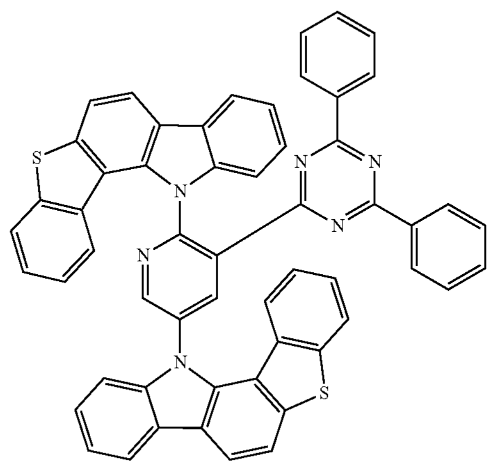
364
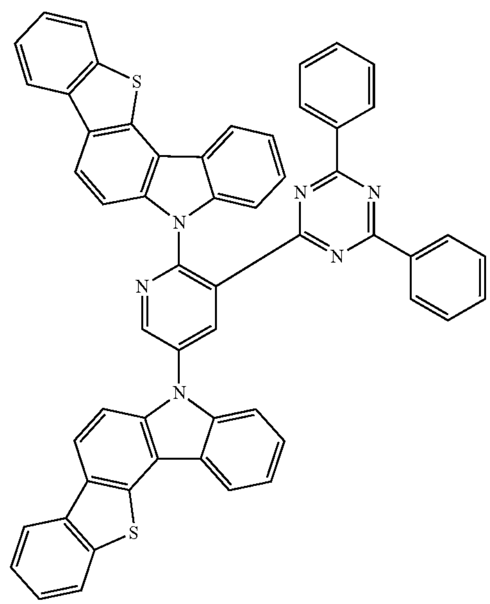
-continued
365
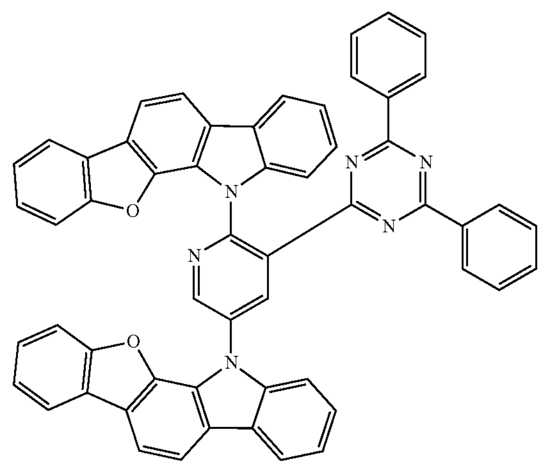
366
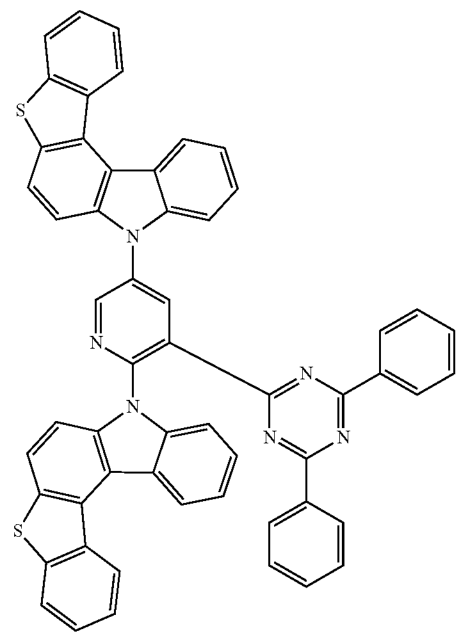

-continued
367
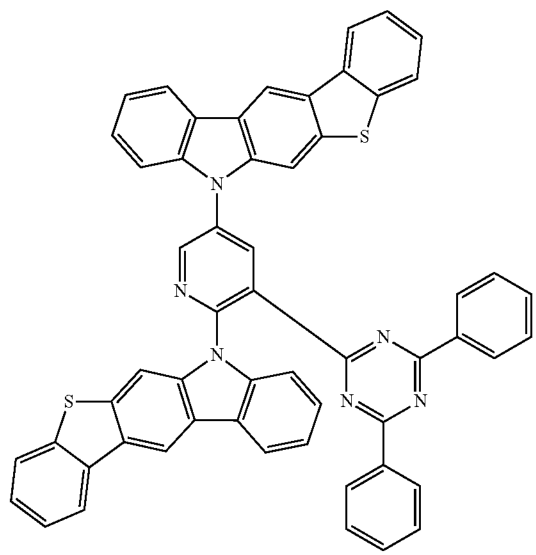
368
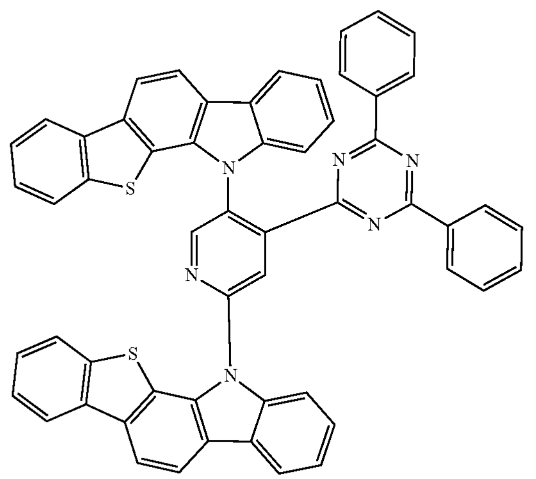
369
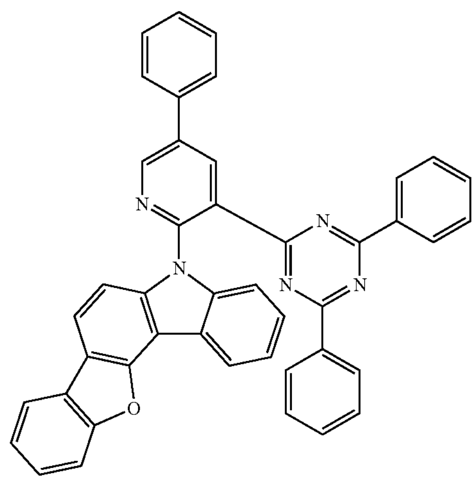
-continued
370
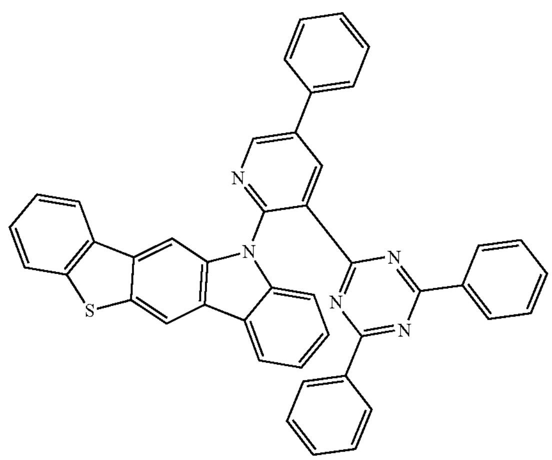
371
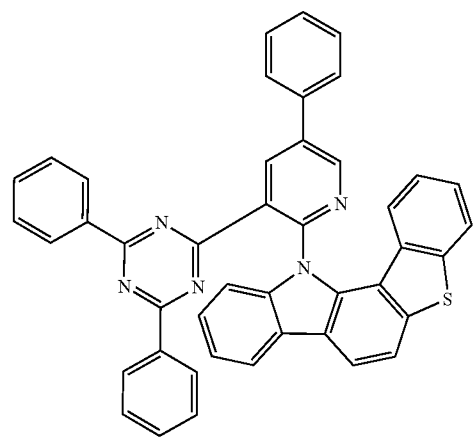
372
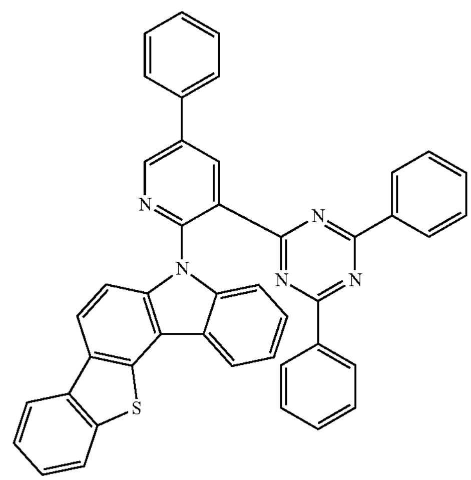

-continued
373
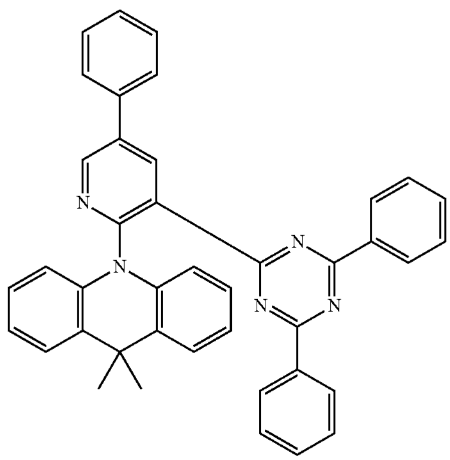
374
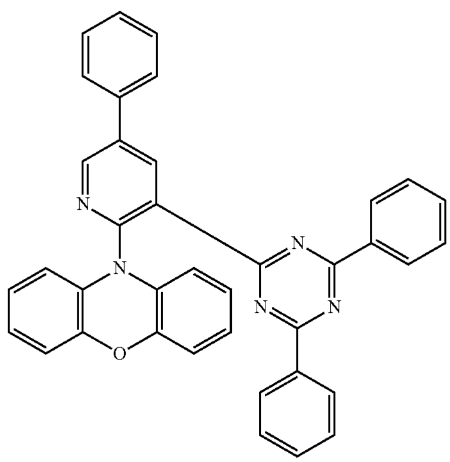
375
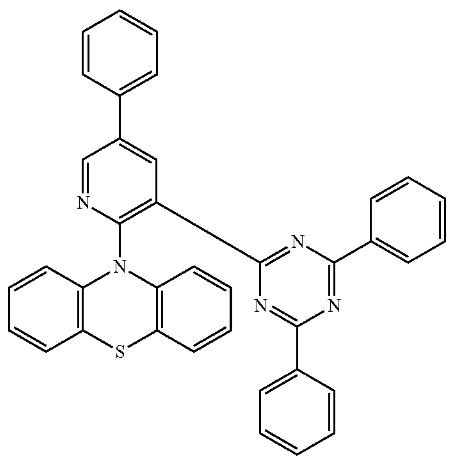
-continued
376
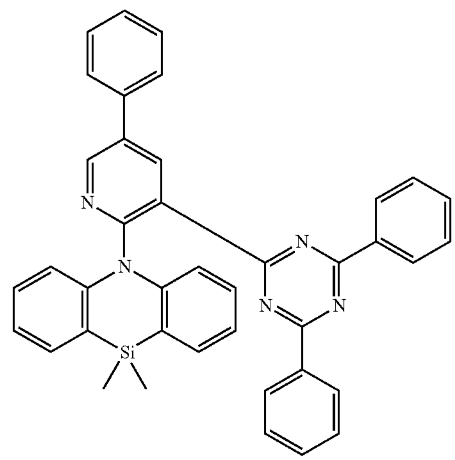
377
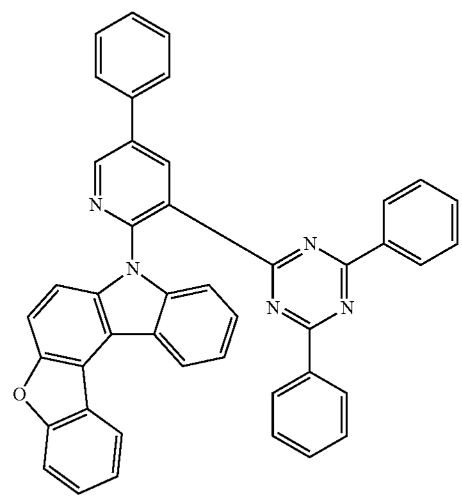
378
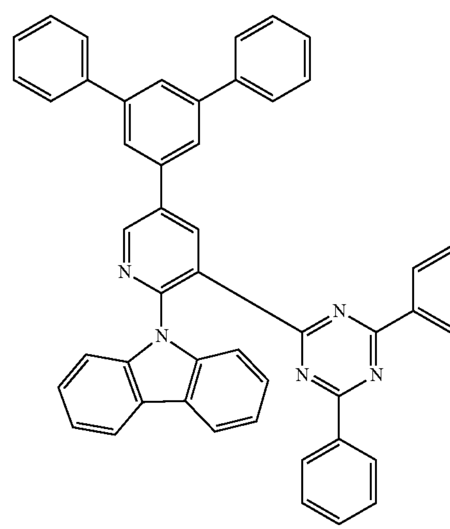

-continued
379
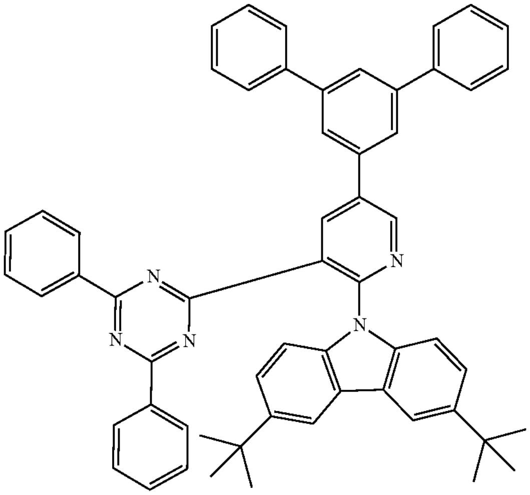
380
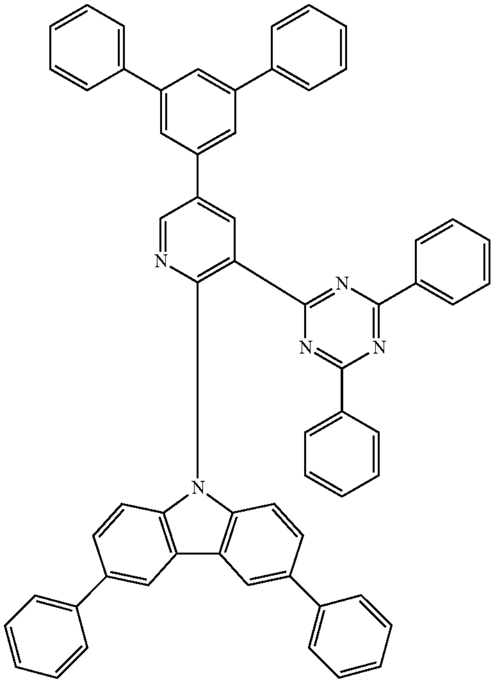
-continued
381
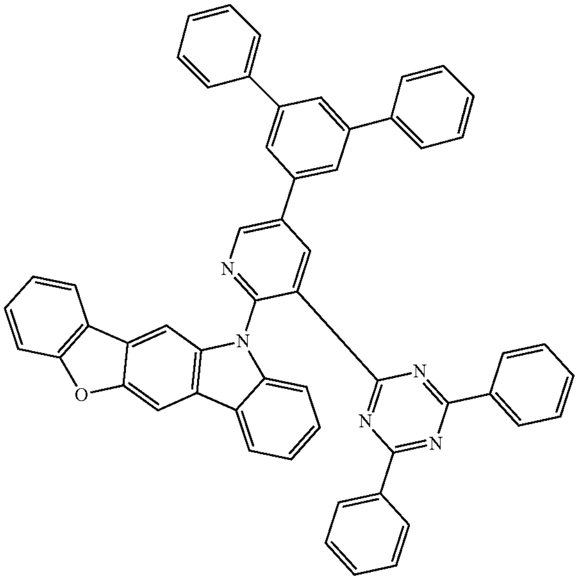
382
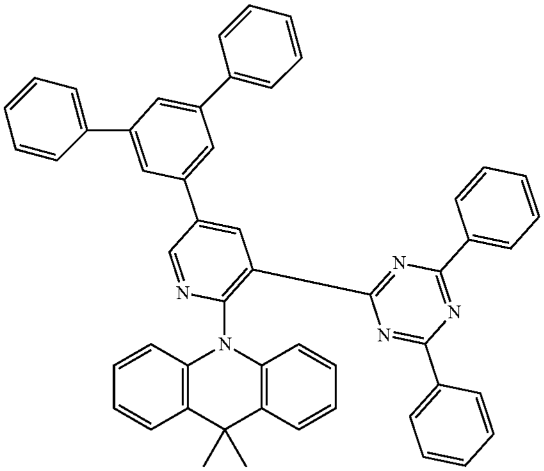
383
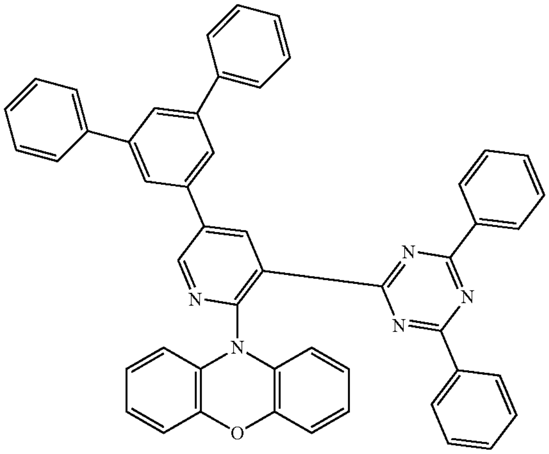

-continued
384
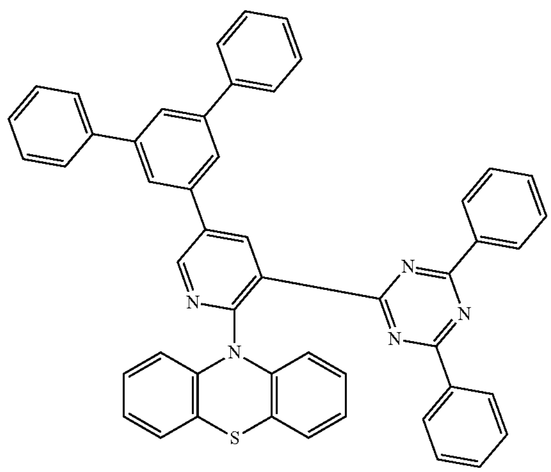
385
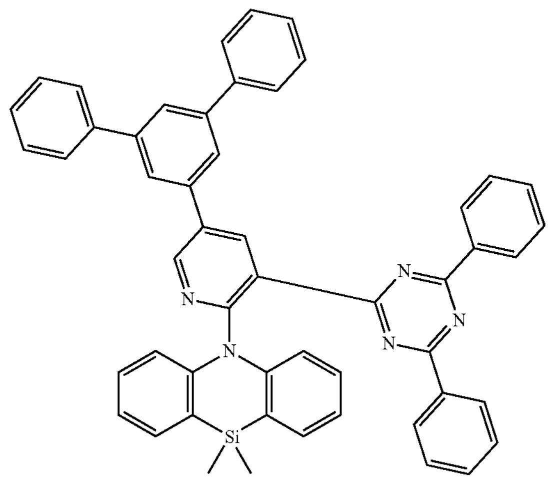
386
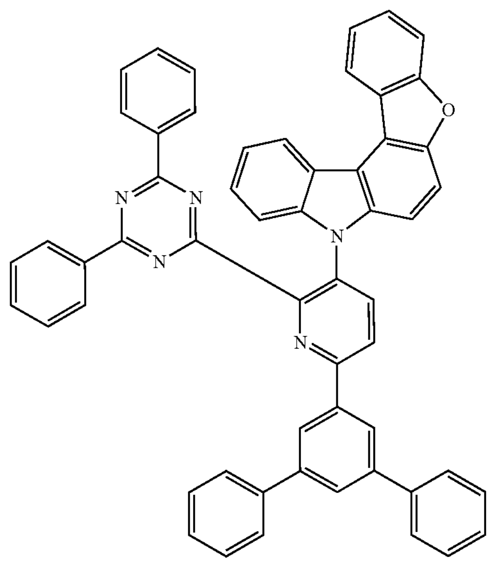
-continued
387
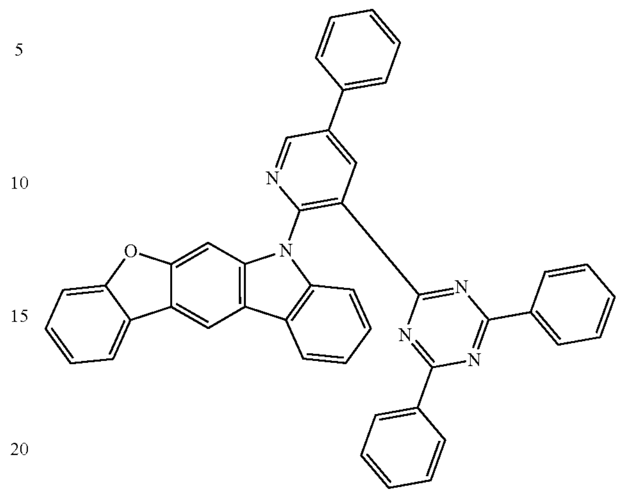
388
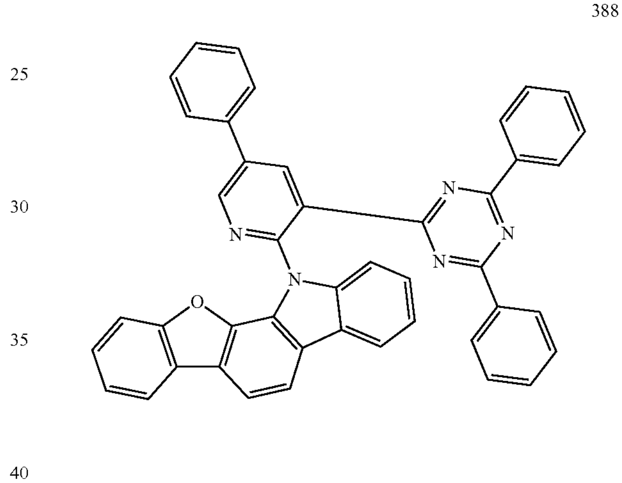
389
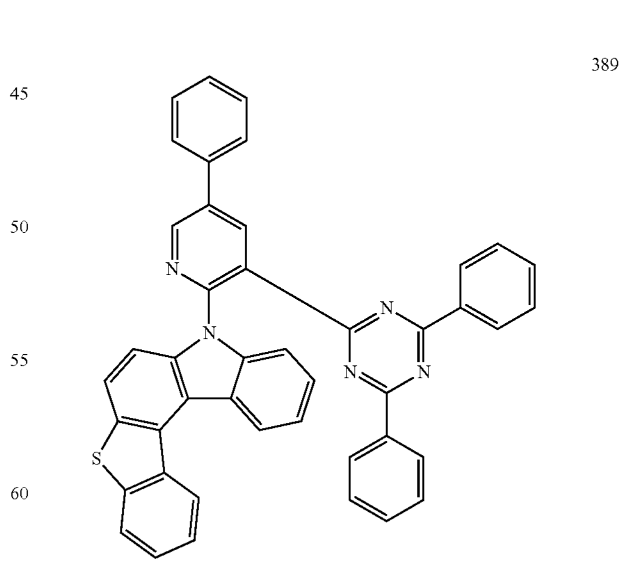

-continued
390
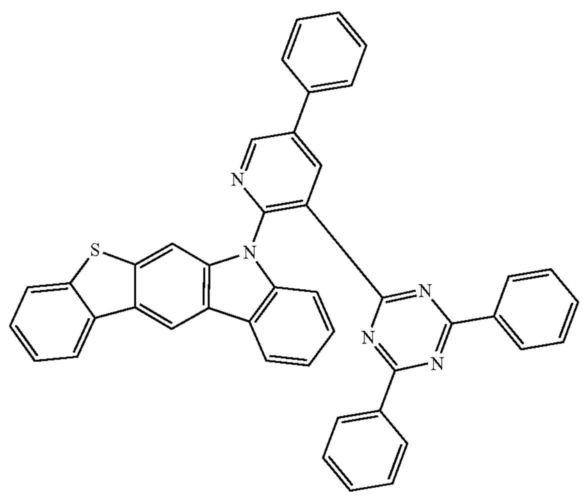
391
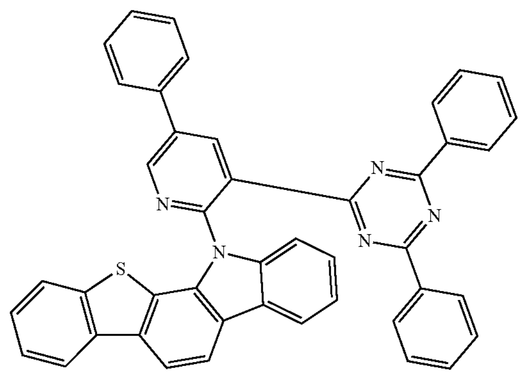
392
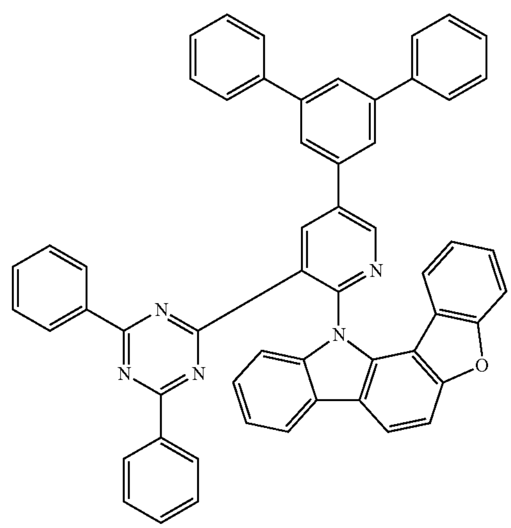
-continued
393
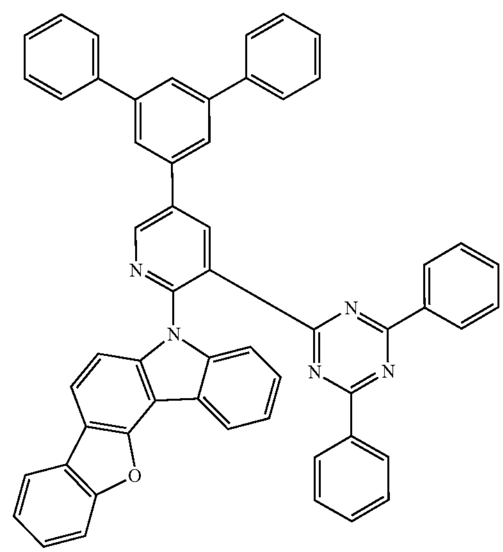
394
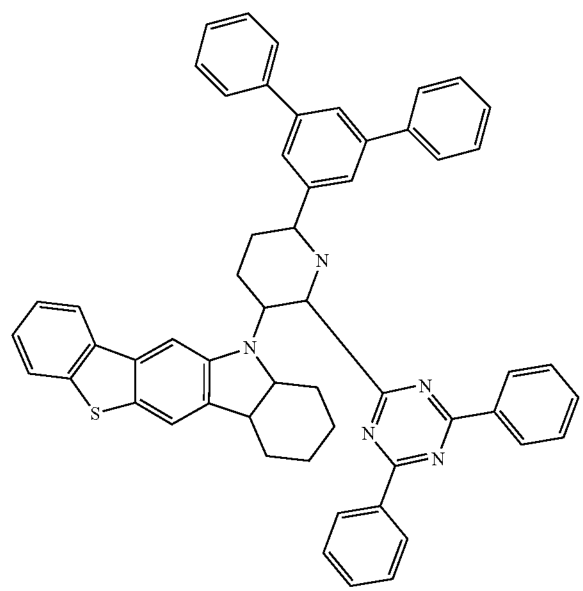

395
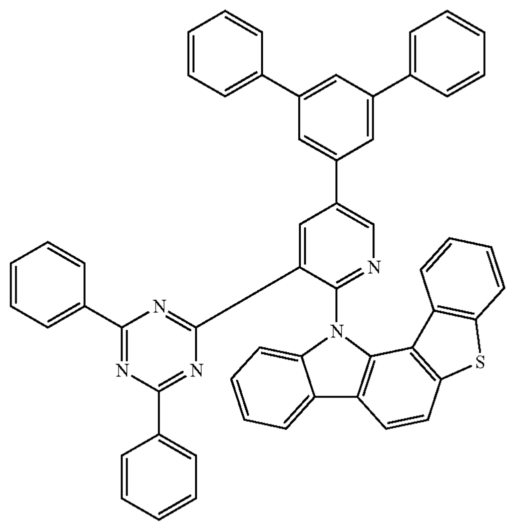
396
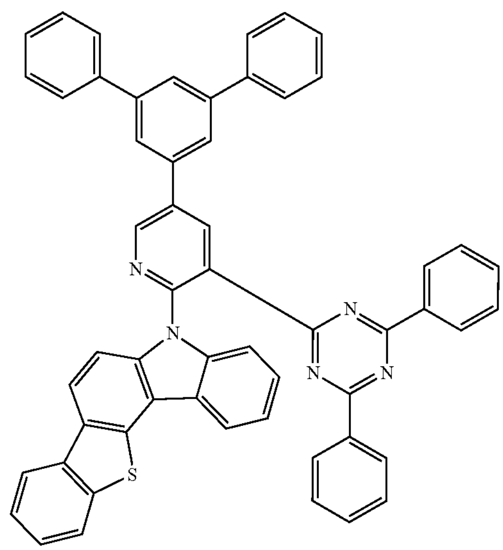
397
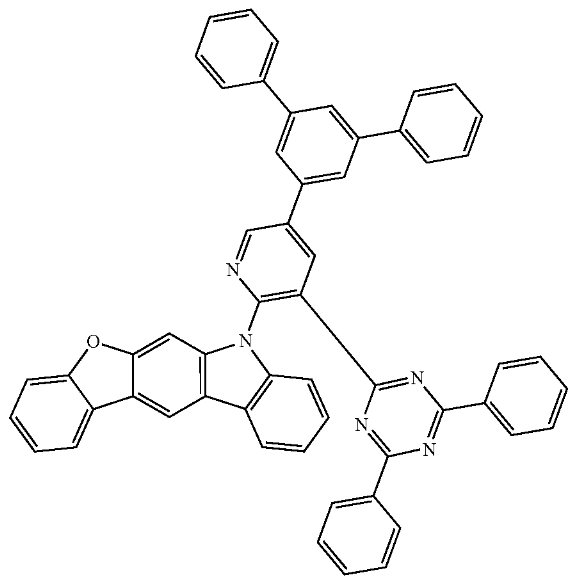
398
399
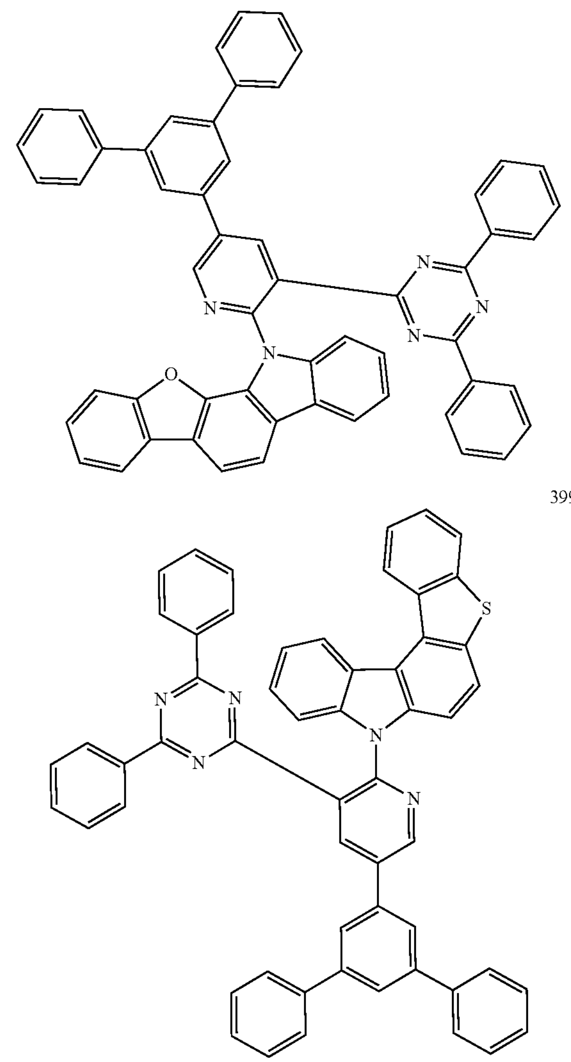

400
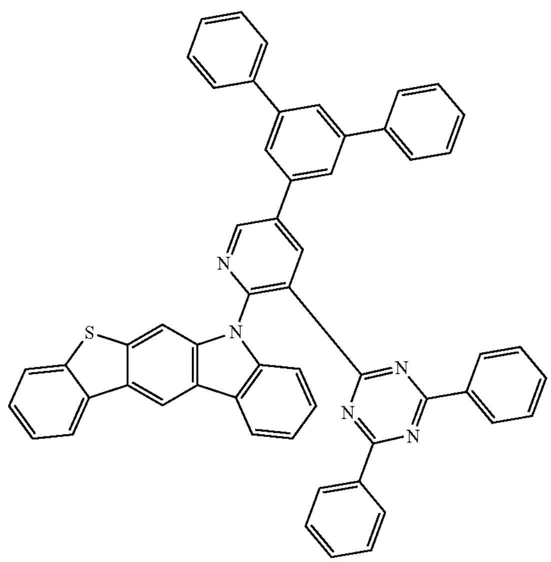
401
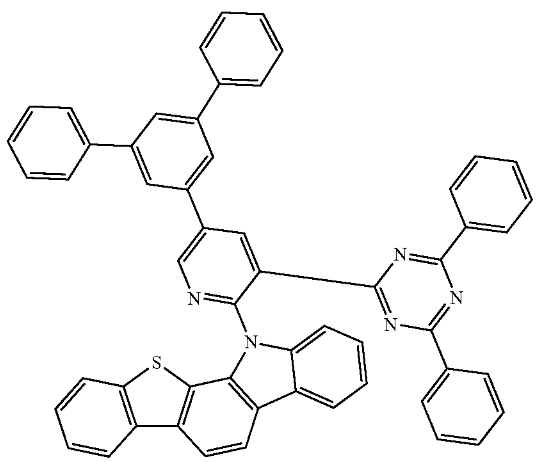
402
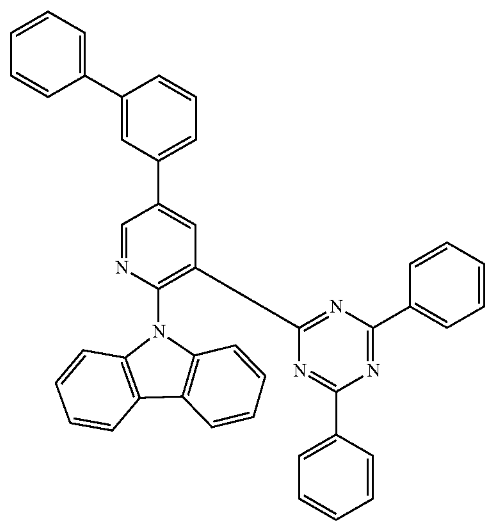
403
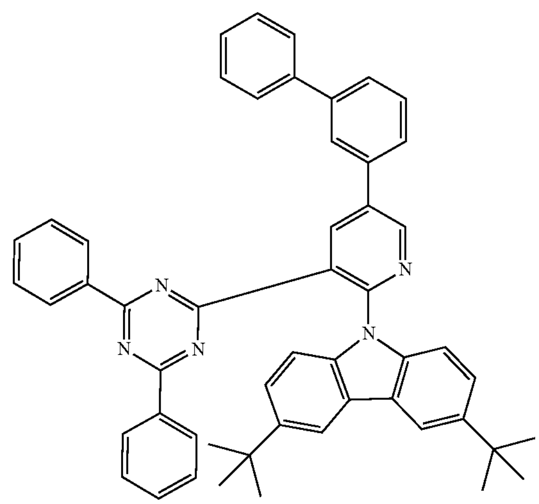
404
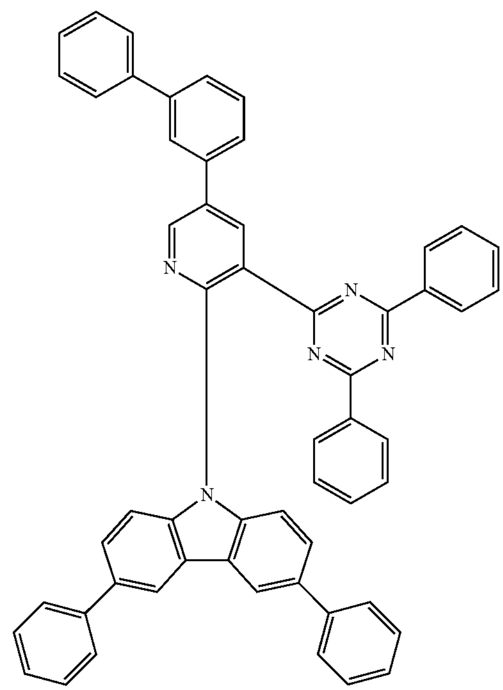

-continued
405
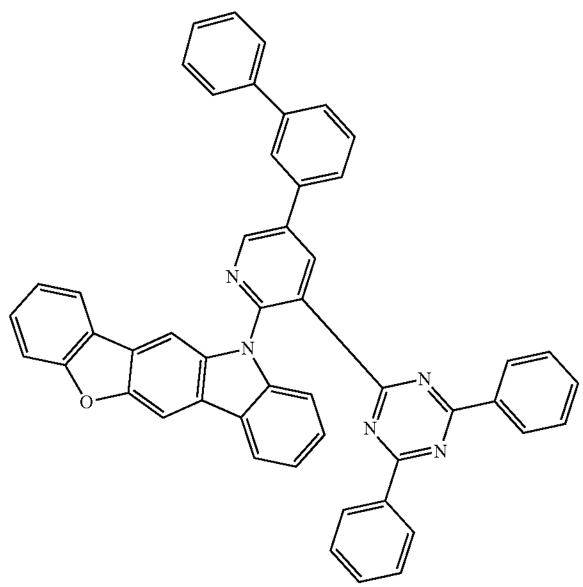
406
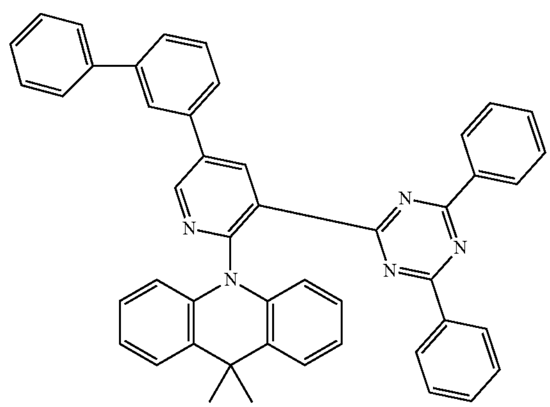
407
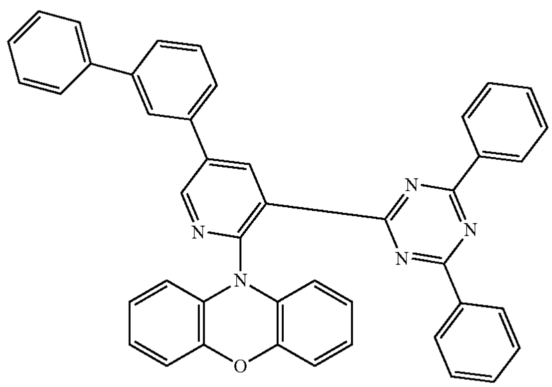
-continued
408
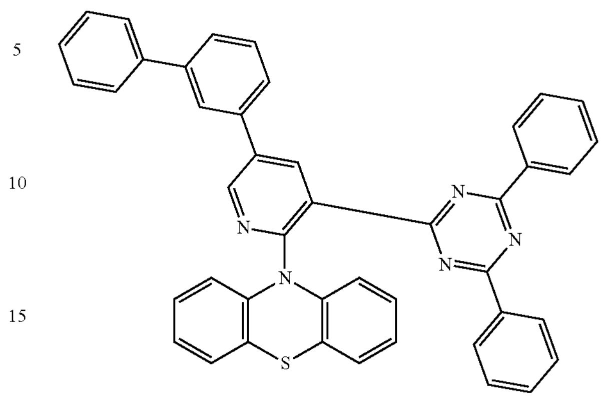
409
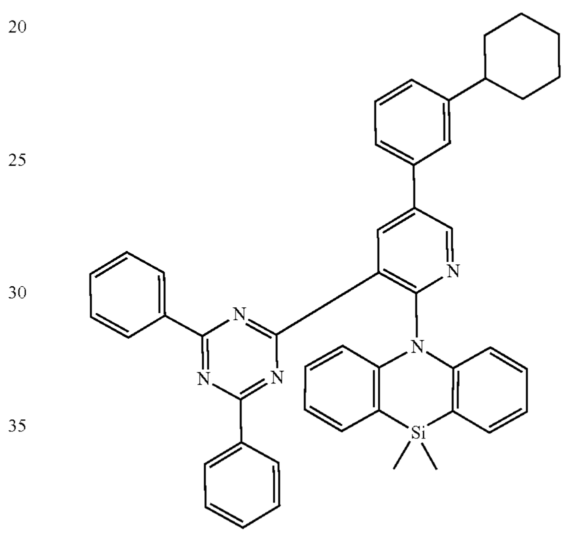
410
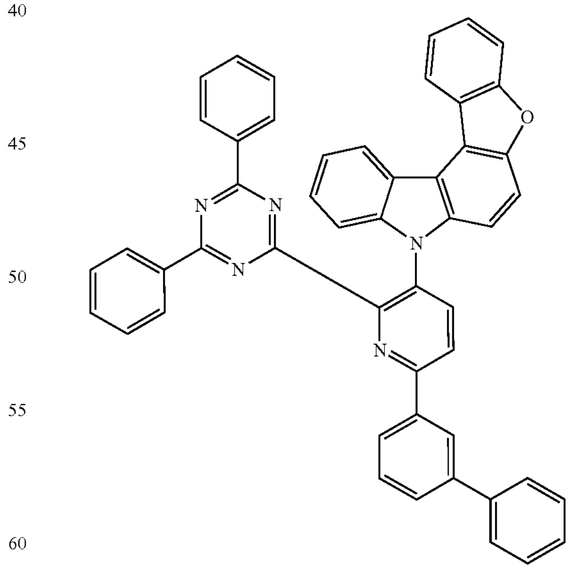

-continued
411
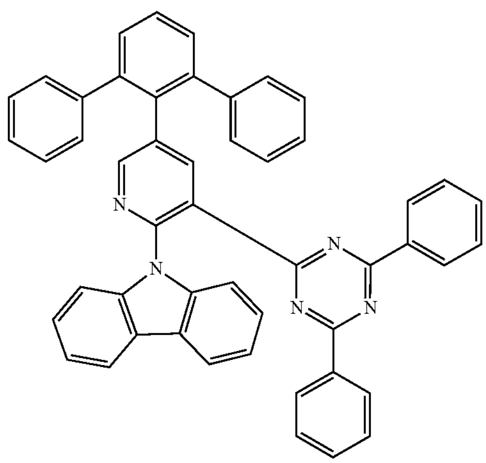
412
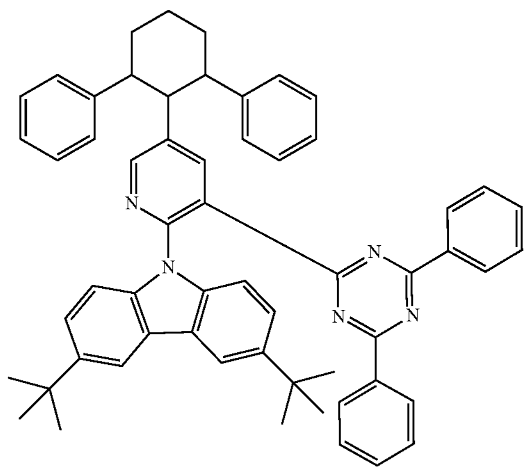
413
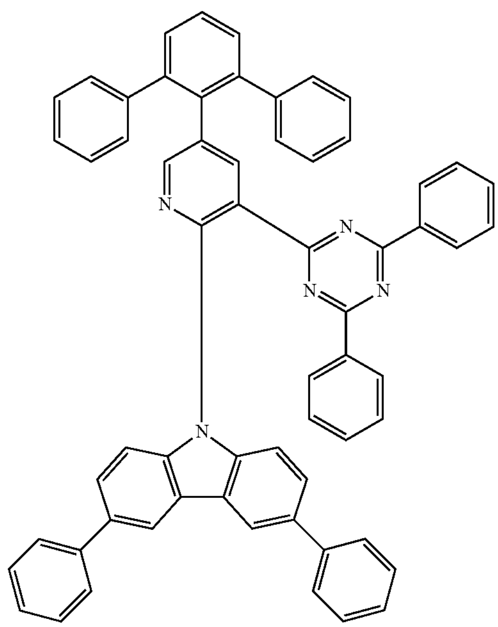
414
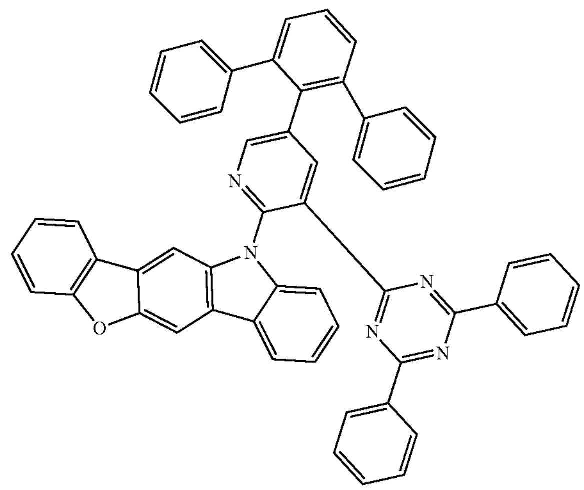
415
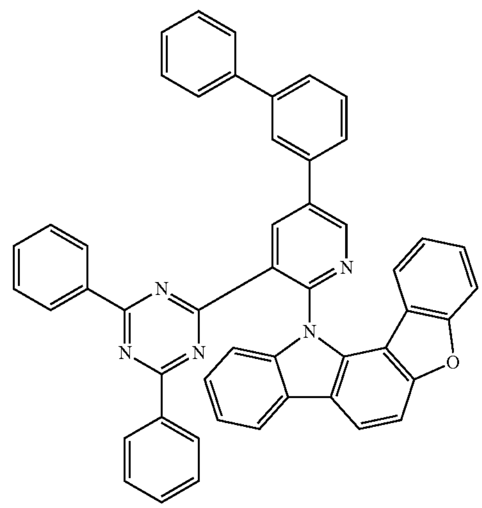
416
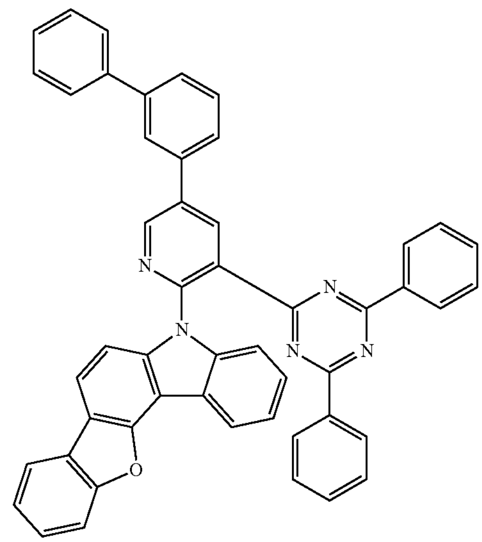

-continued
417
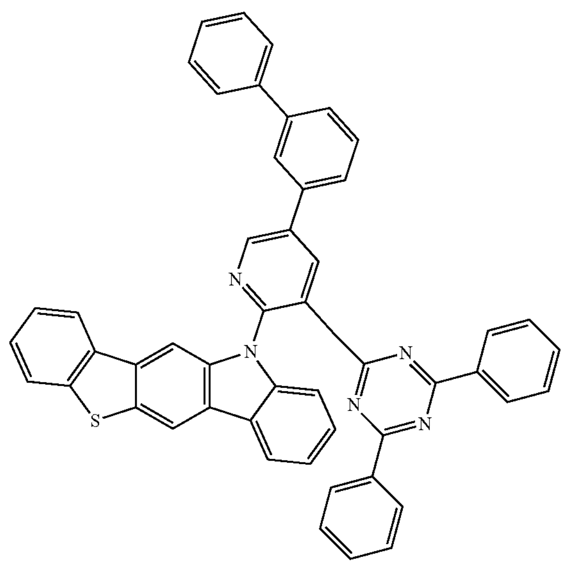
418
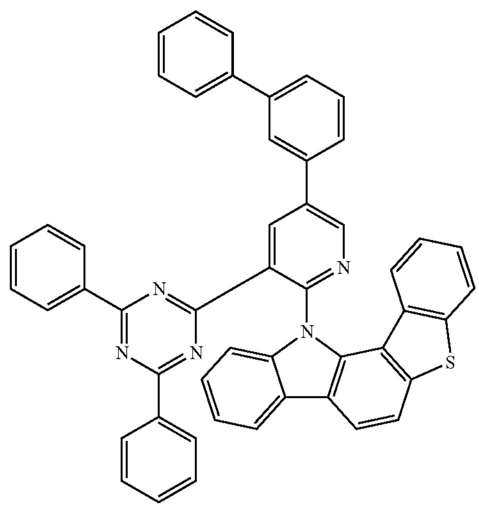
419
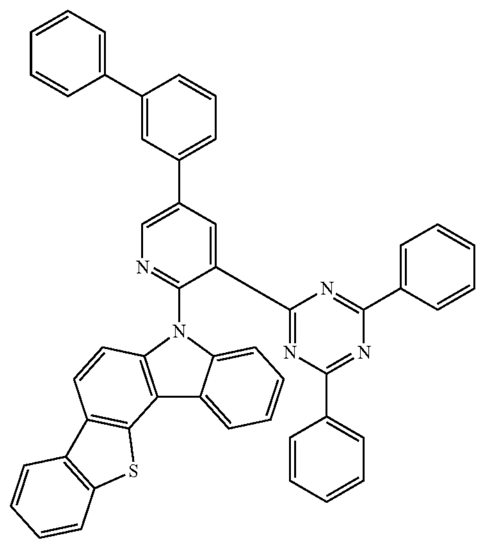
-continued
420
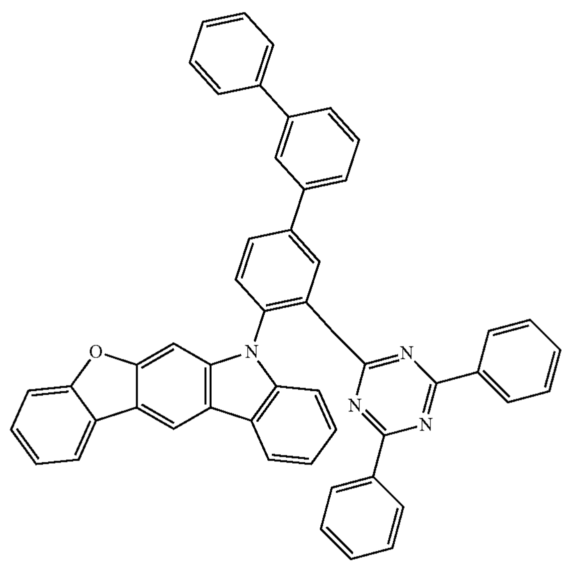
421
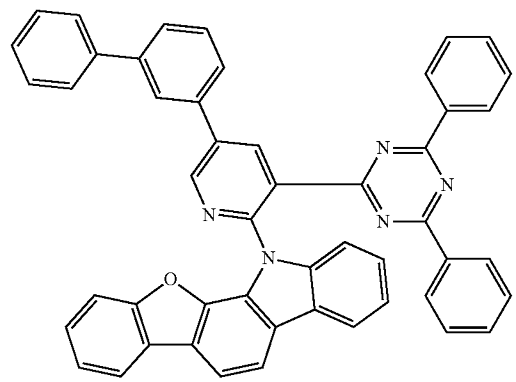
423
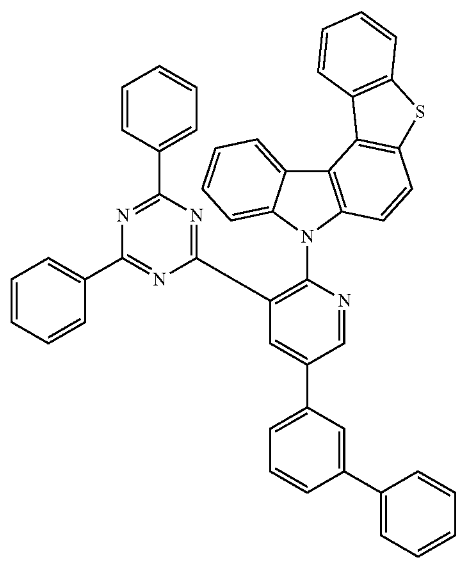

-continued
424
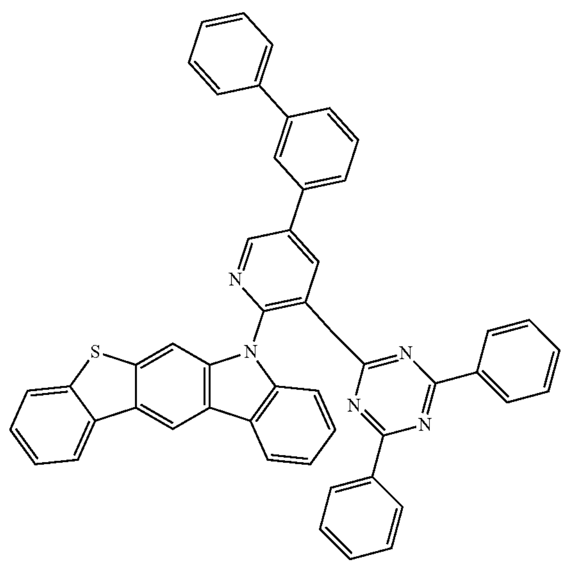
425
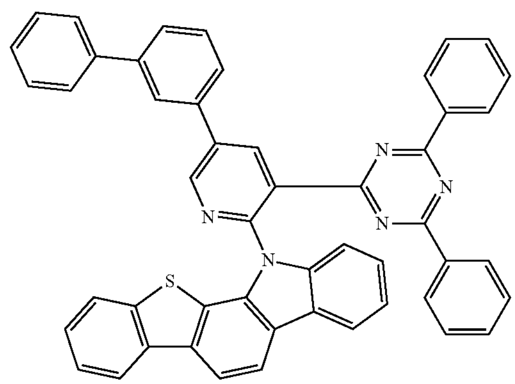
426
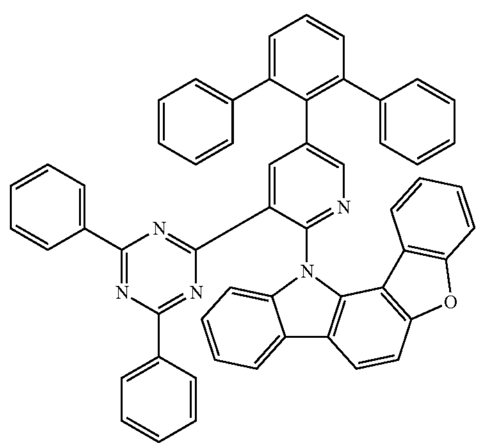
-continued
427
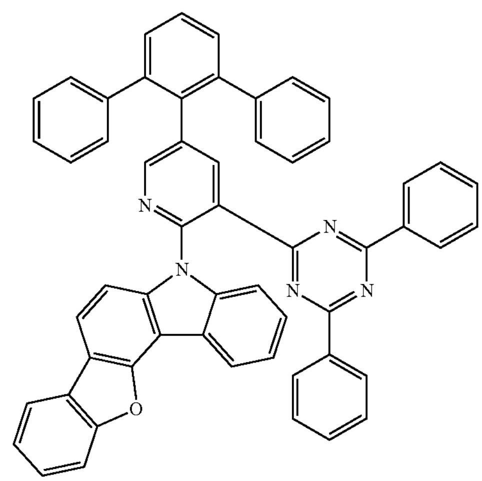
428
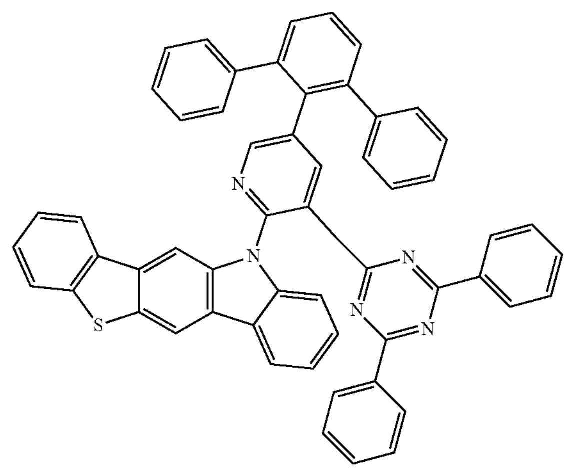
429
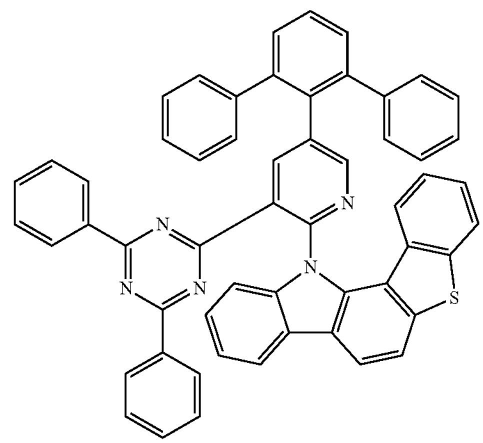

-continued
430
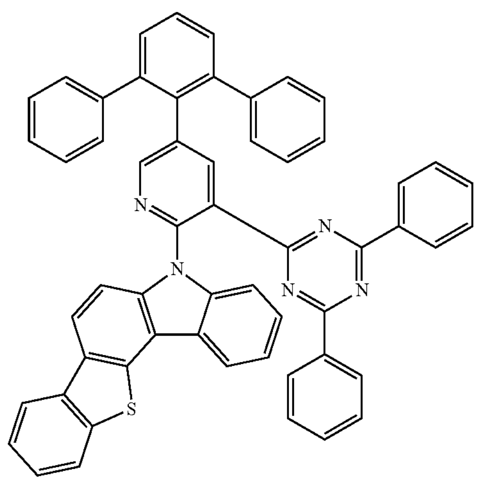
431
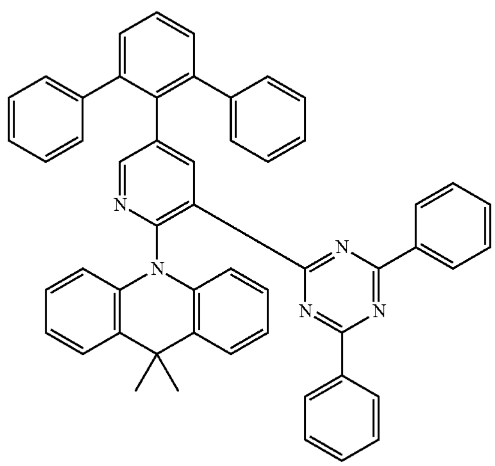
432
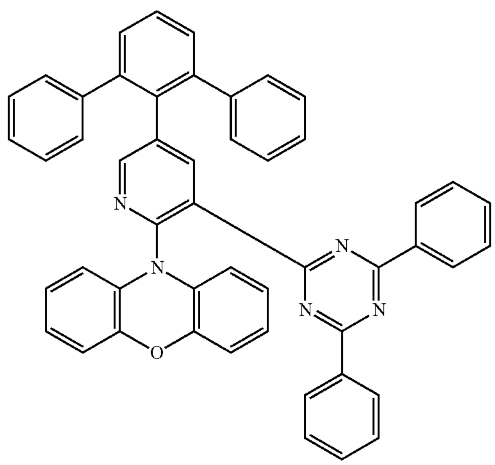
-continued
433
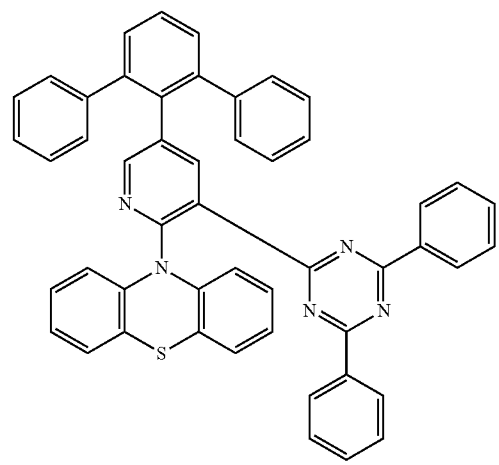
434
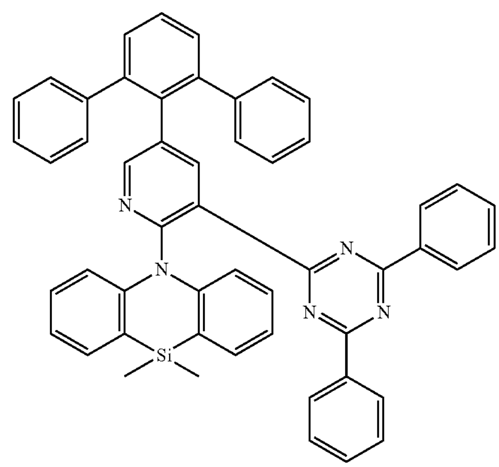
435
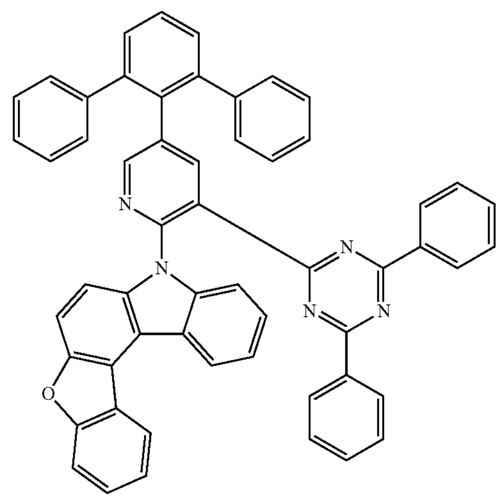

-continued
436
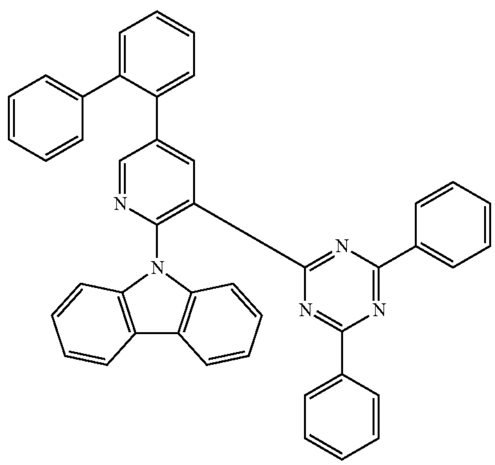
437
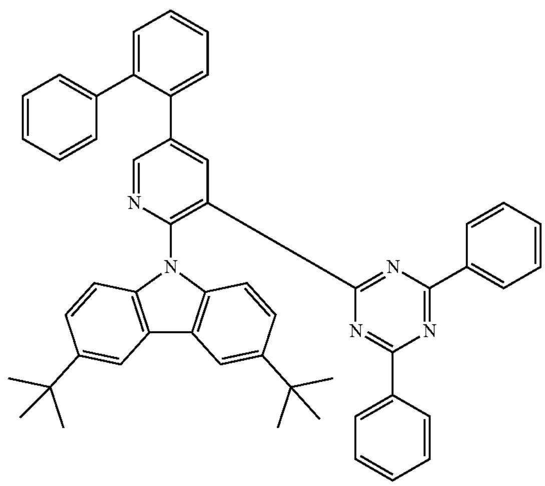
438
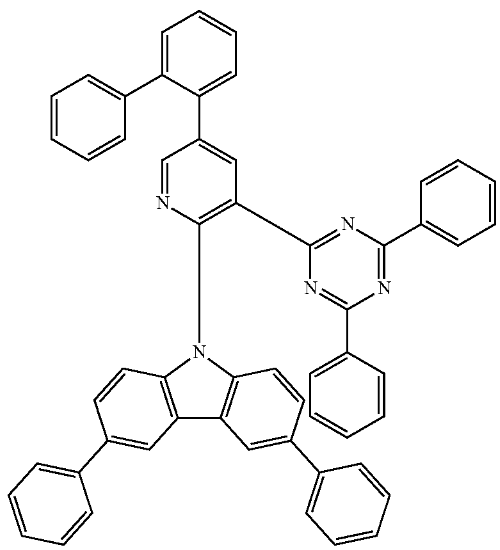
-continued
439
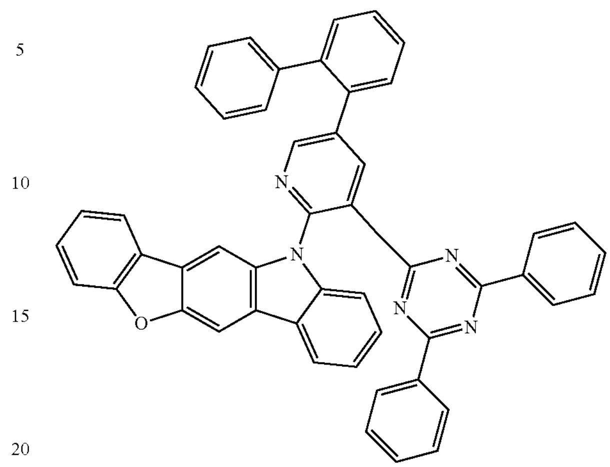
440
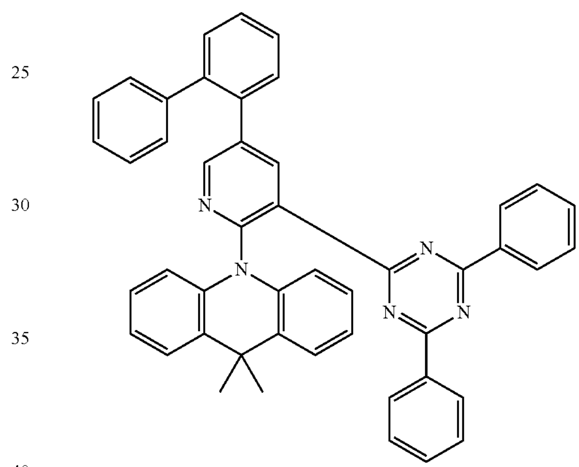
441
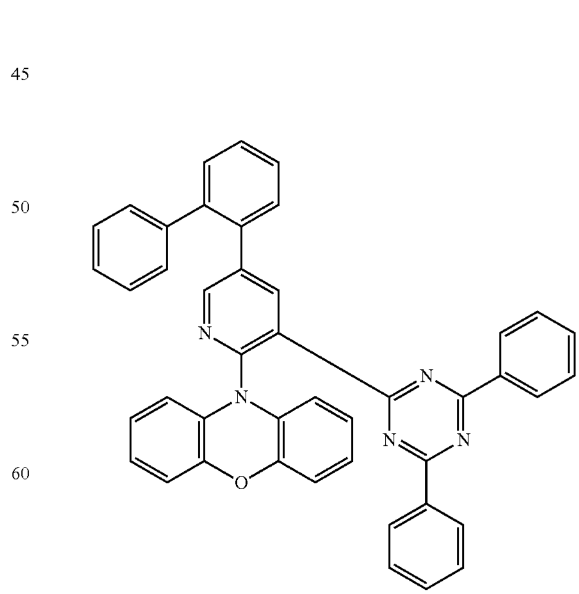

-continued
442
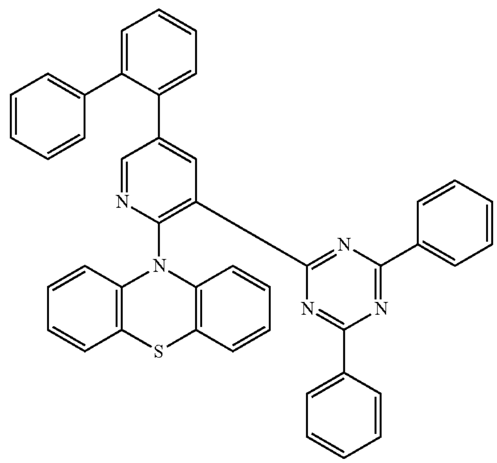
444
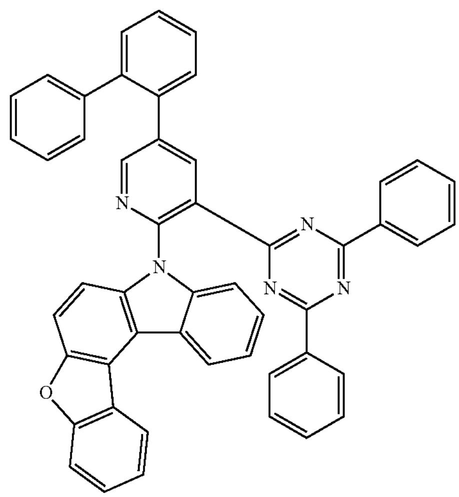
445
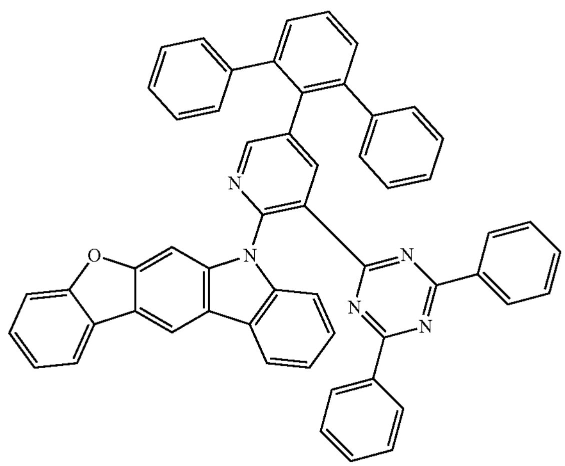
-continued
446
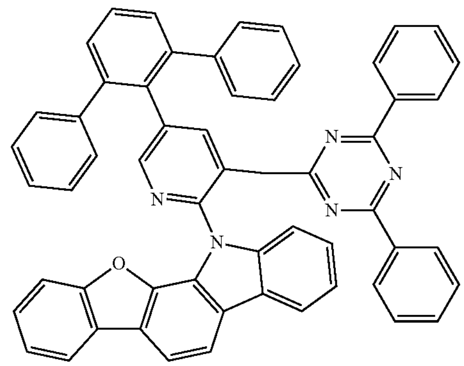
447
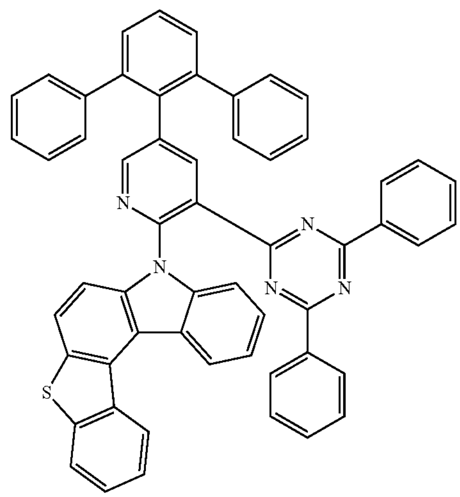
448
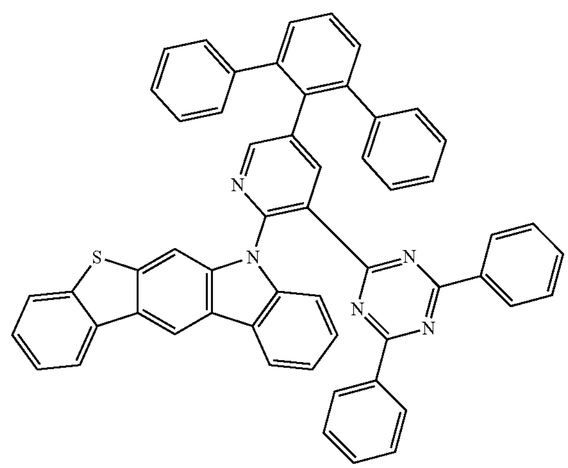

-continued
449
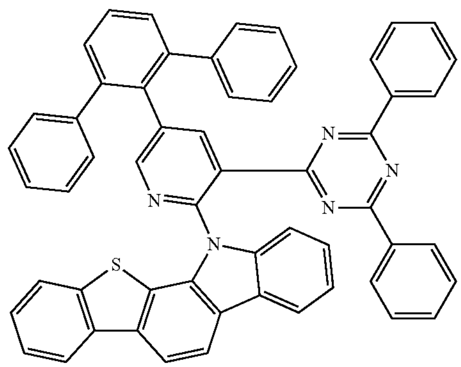
450
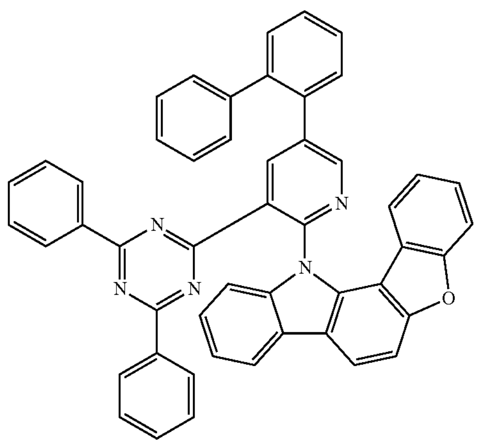
451
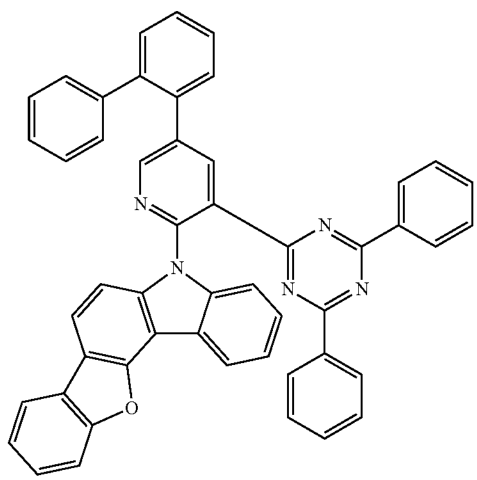
-continued
452
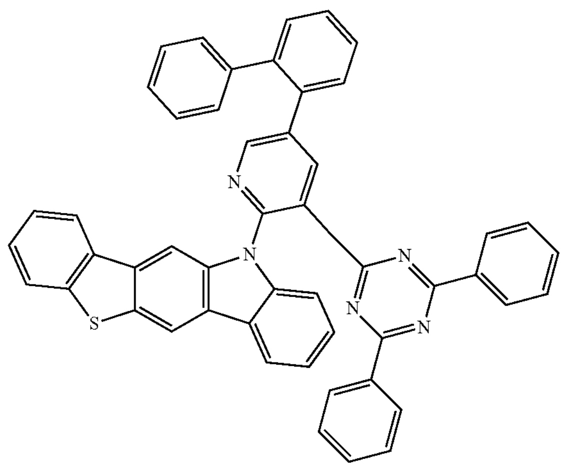
453
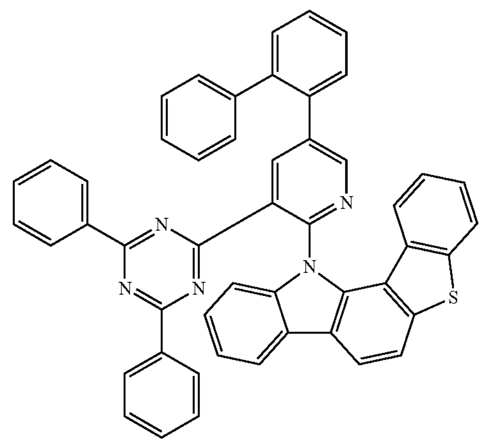
454
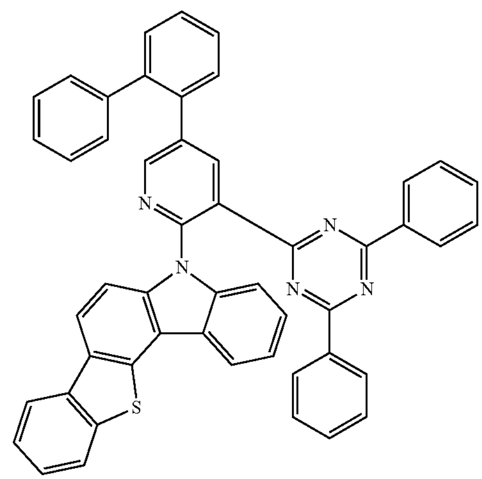

-continued
455
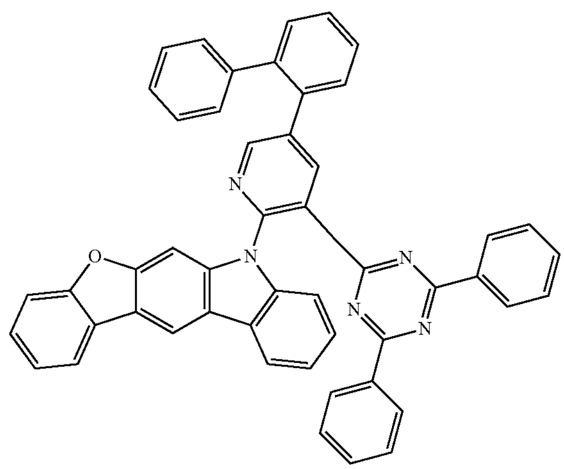
456
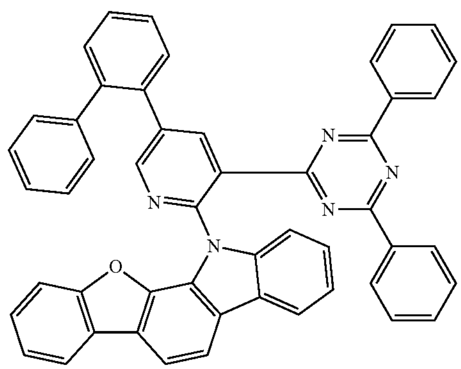
457
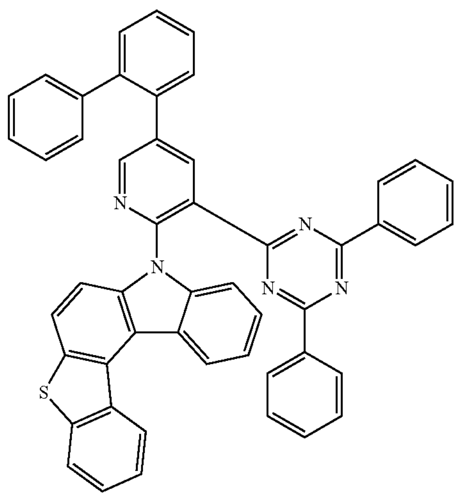
-continued
458
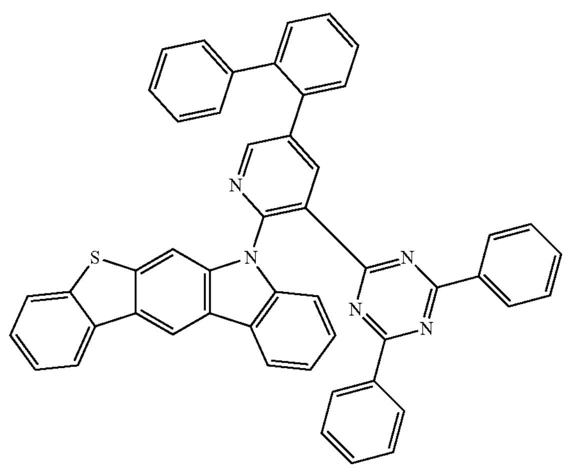
459
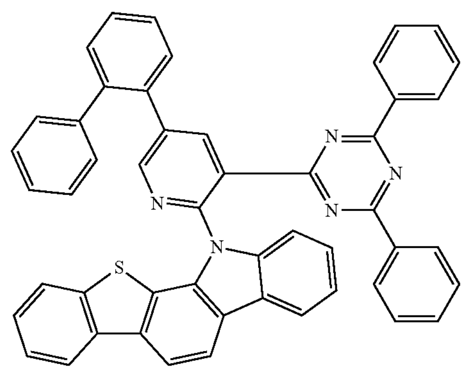
460
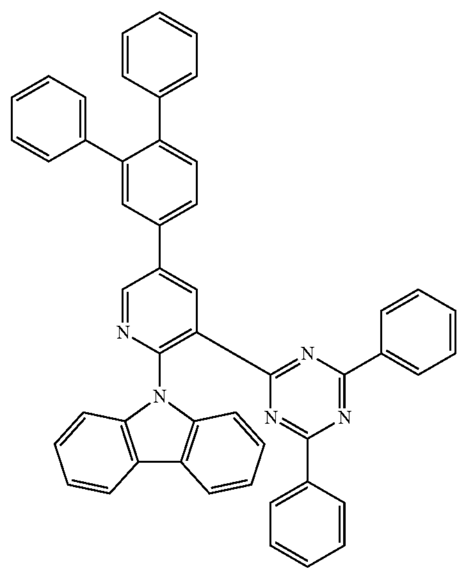

-continued
461
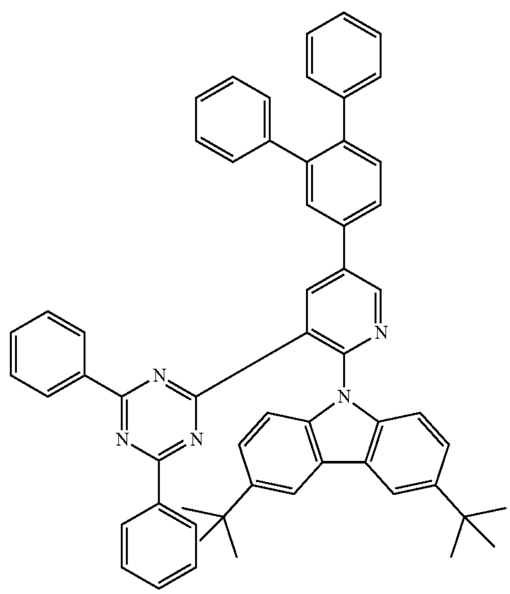
462
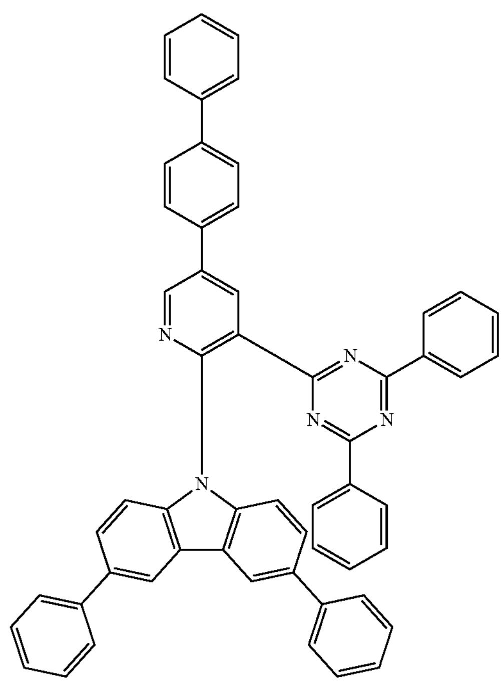
-continued
463
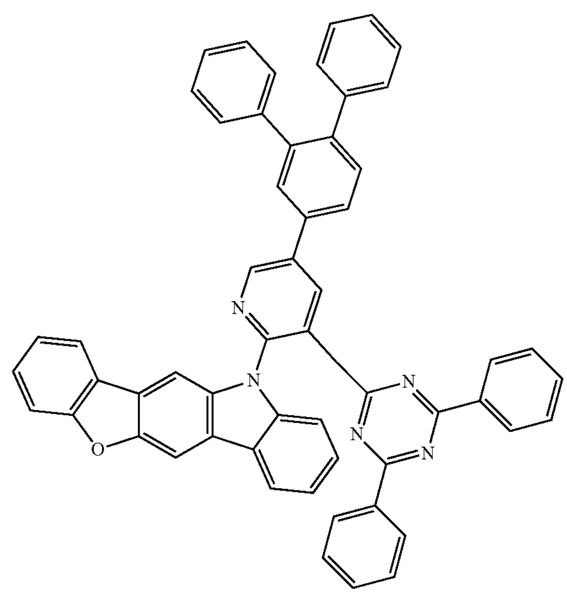
464
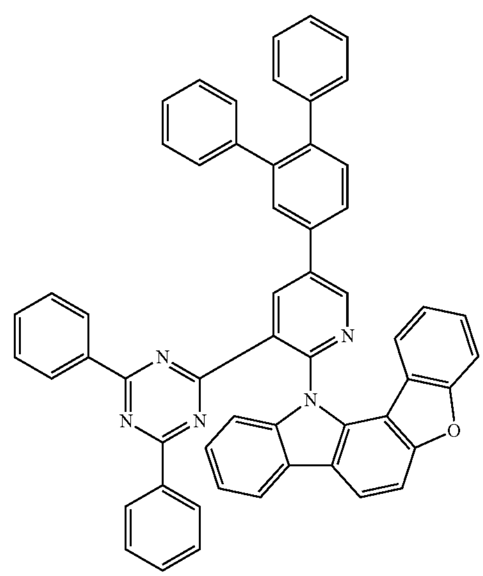

-continued
465
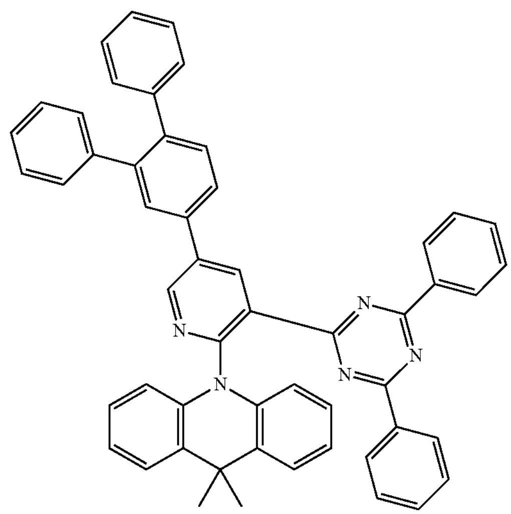
466
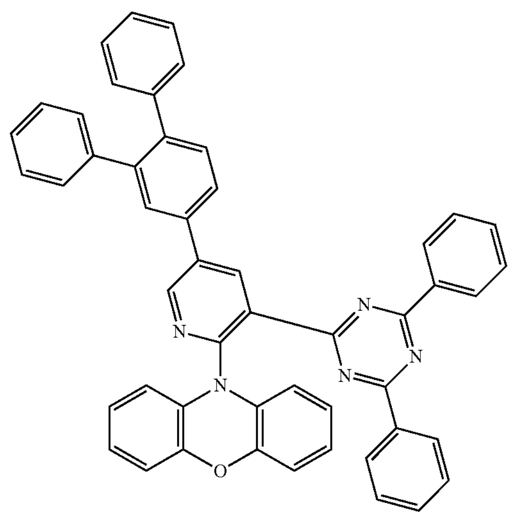
467
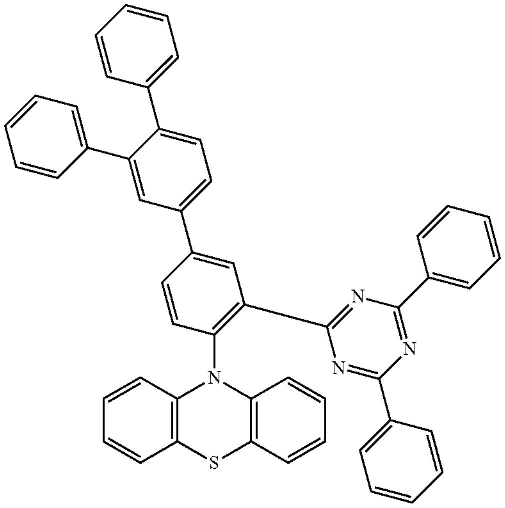
-continued
468
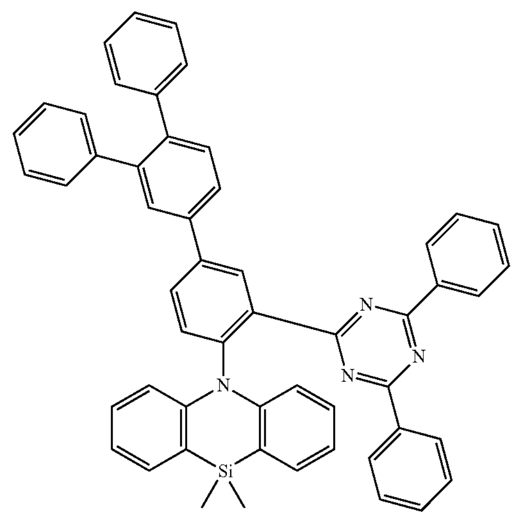
469
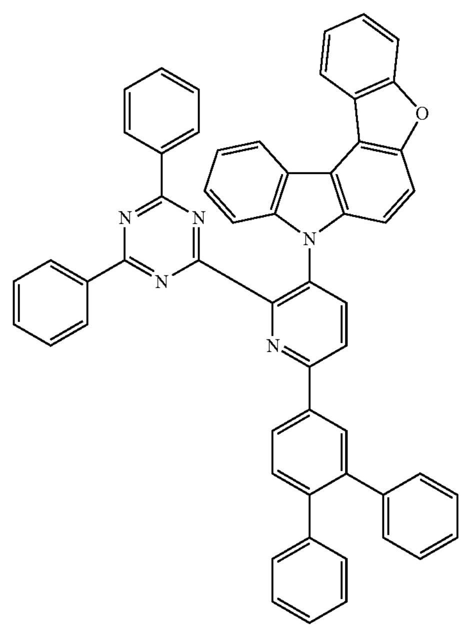

-continued
470
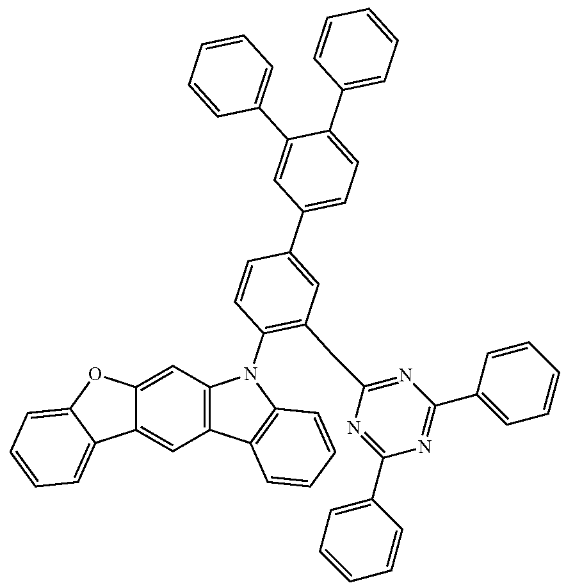
472
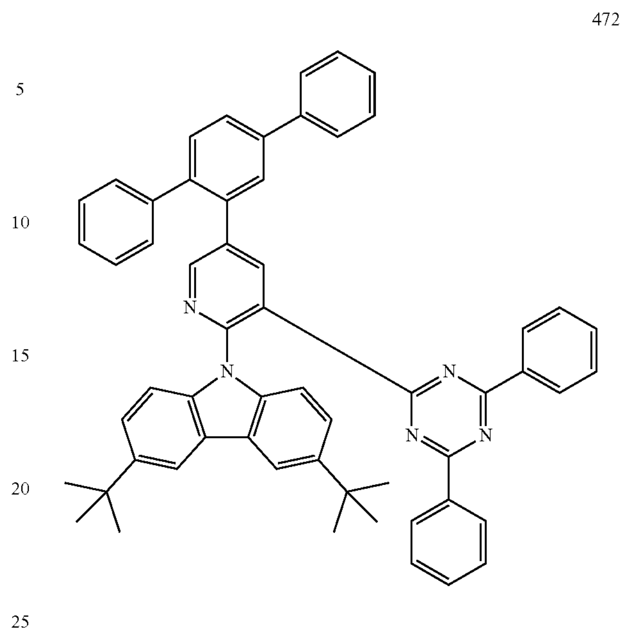
471
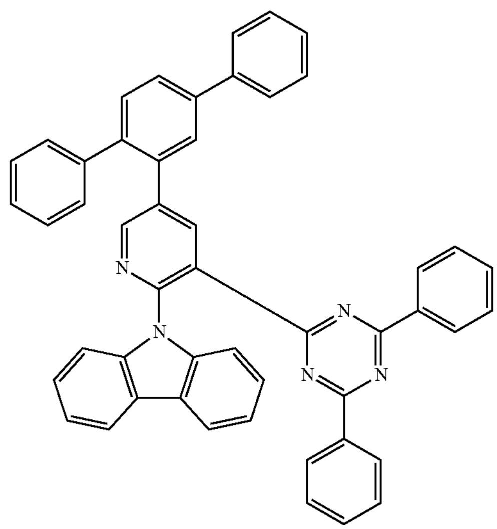
473
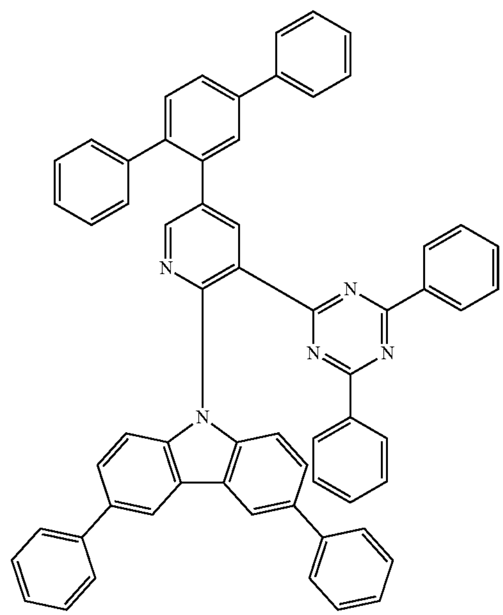
-continued -continued
474
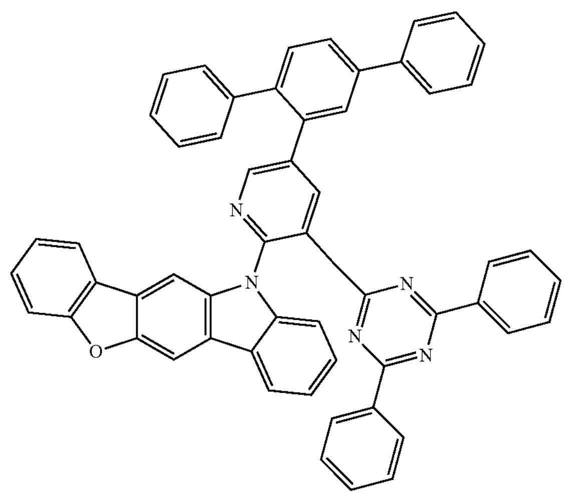
475
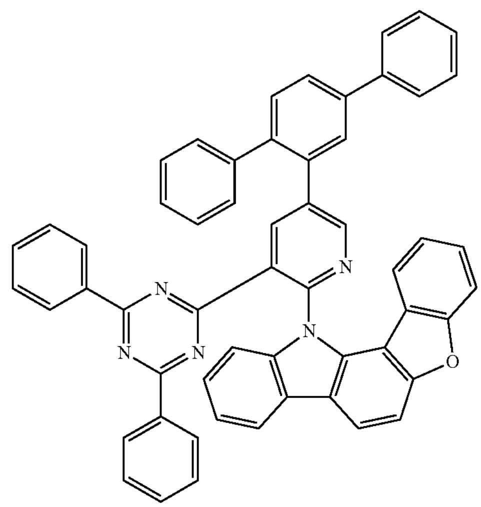
476
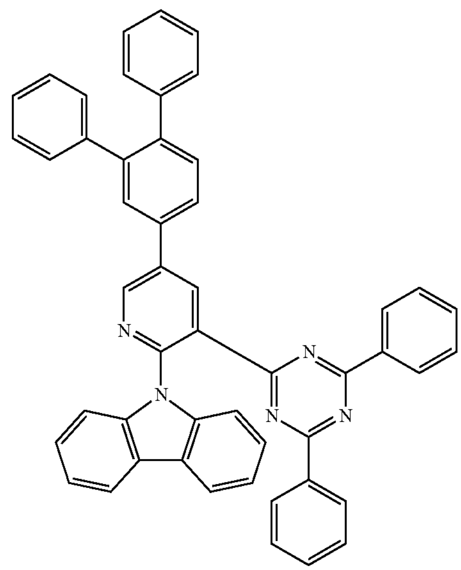
-continued
477
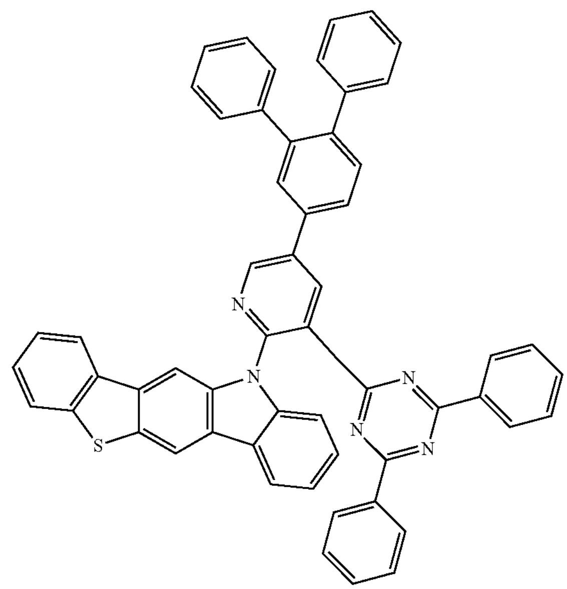
478
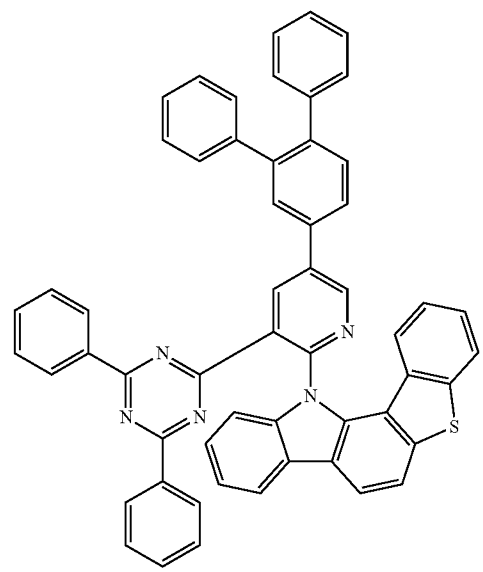

-continued
479
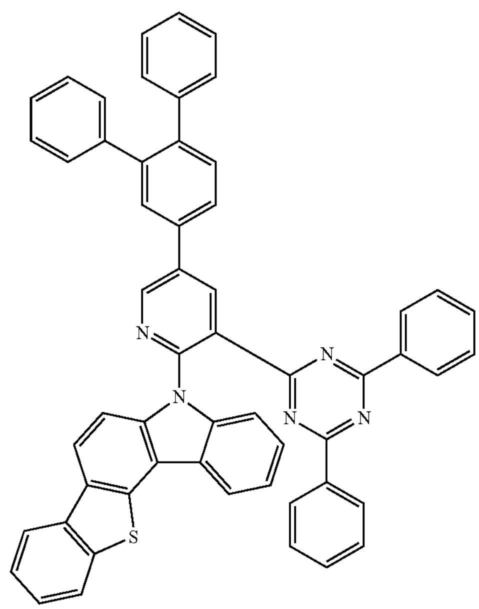
480
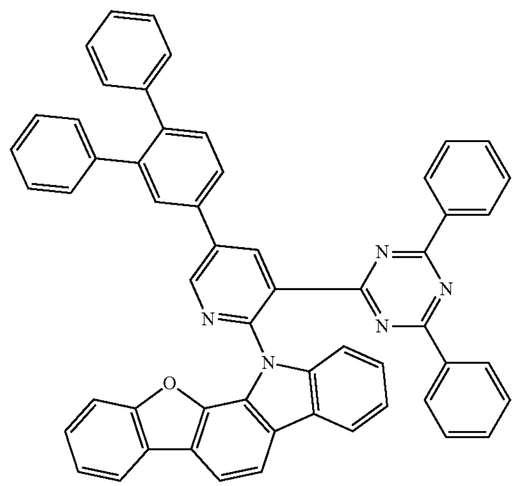
-continued
481
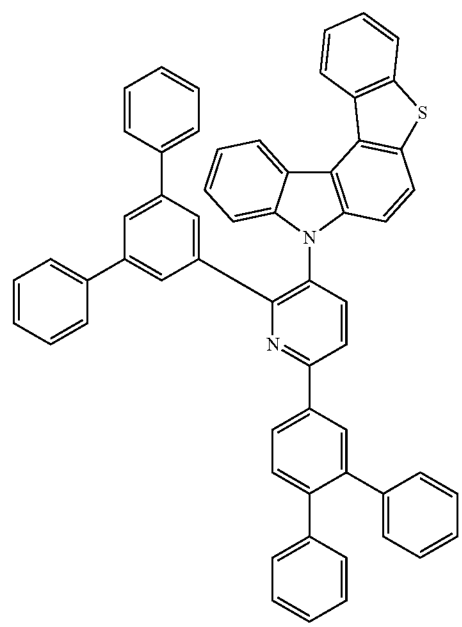
482
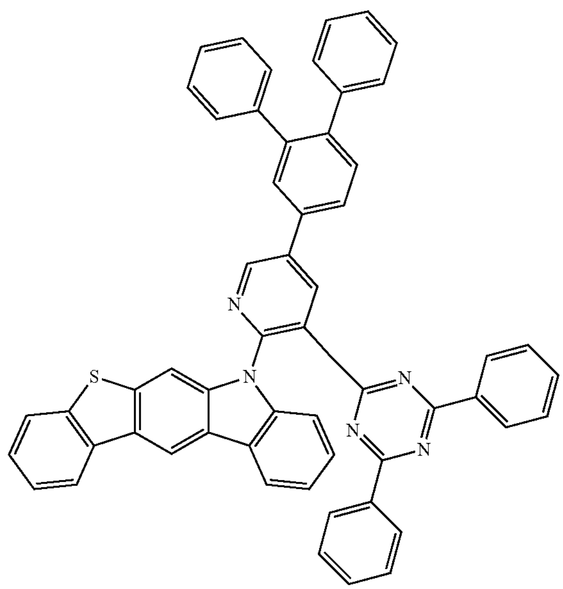

-continued
483
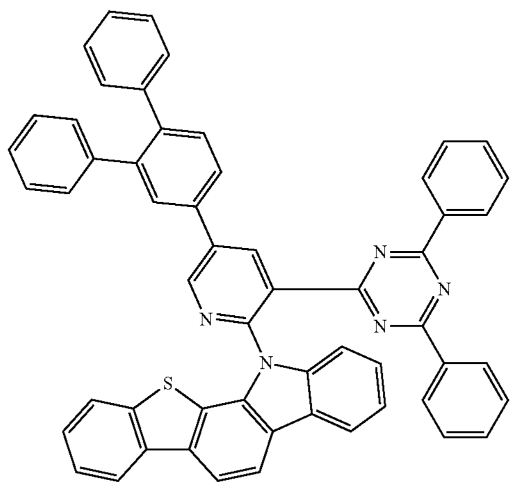
484
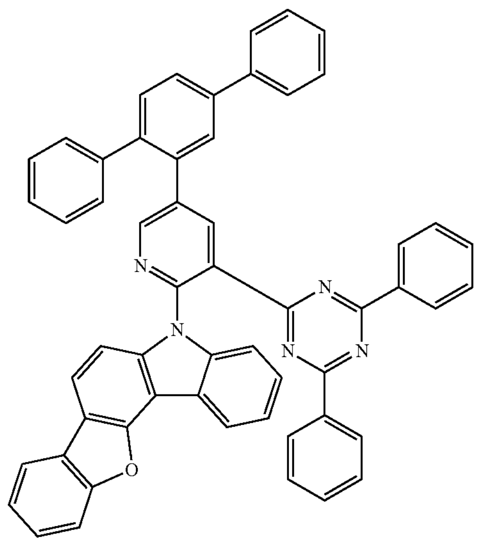
485
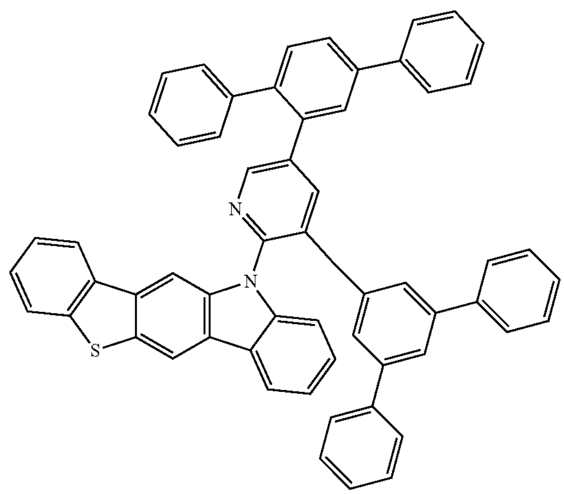
-continued
486
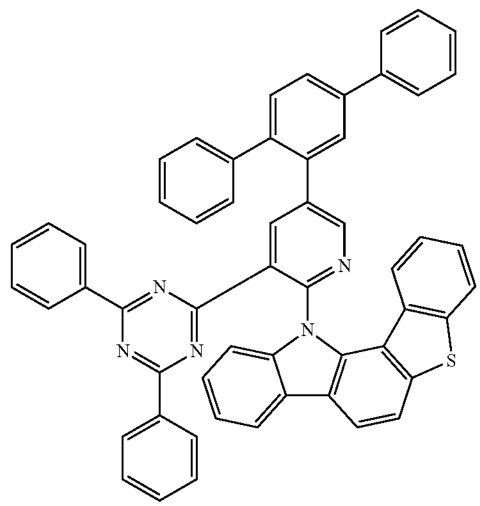
487
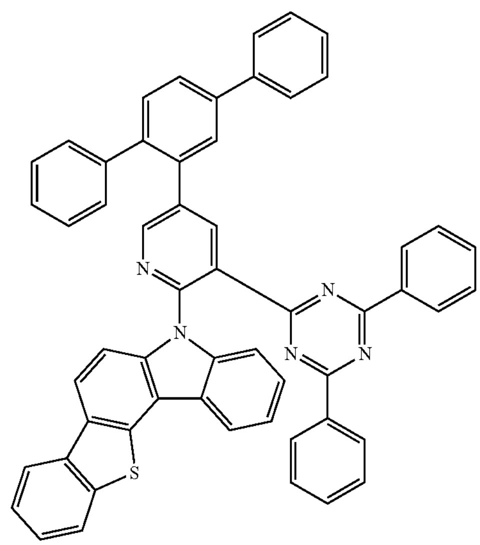
488
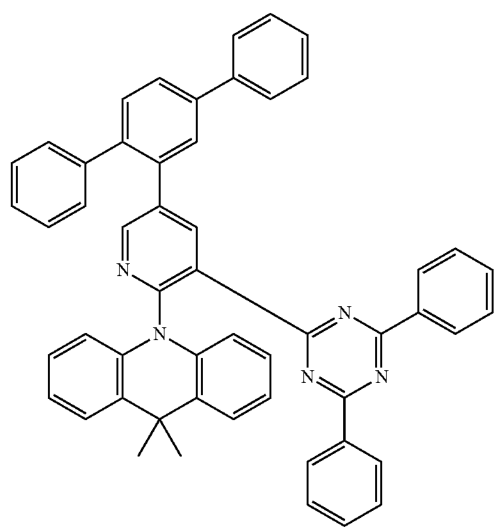

-continued
489
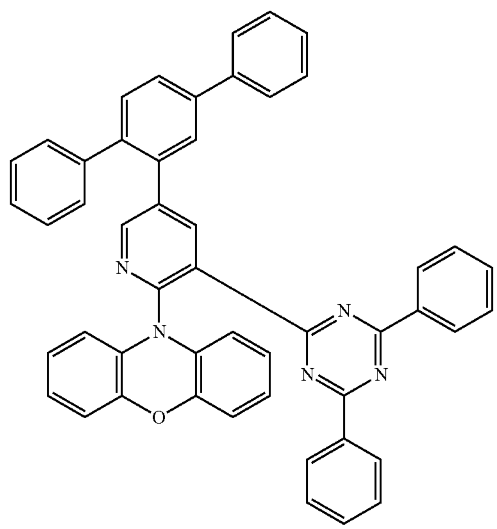
490
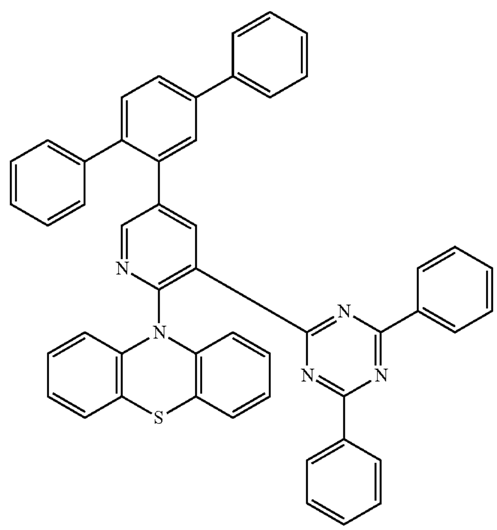
491
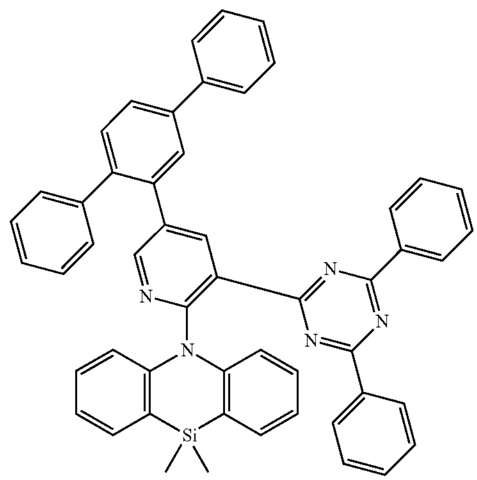
-continued
492
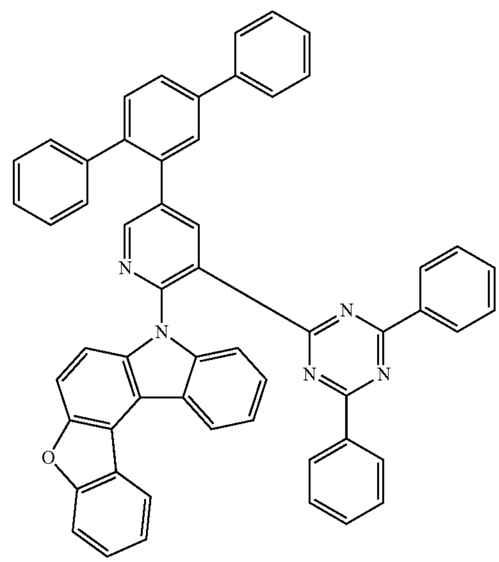
493
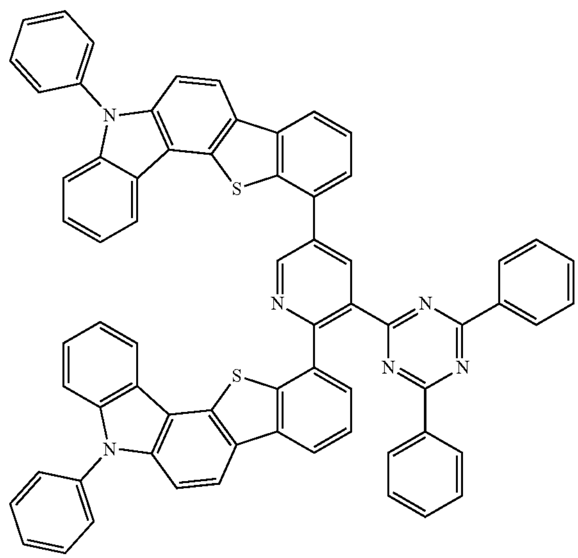

-continued
494
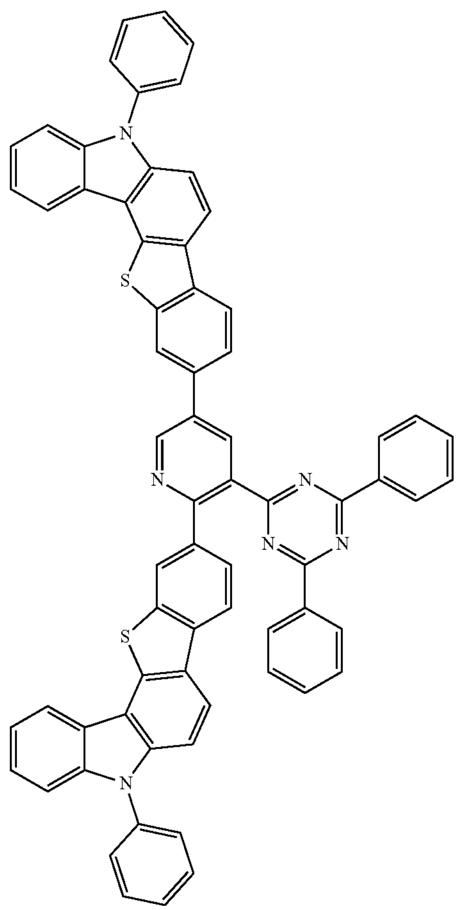
-continued
495
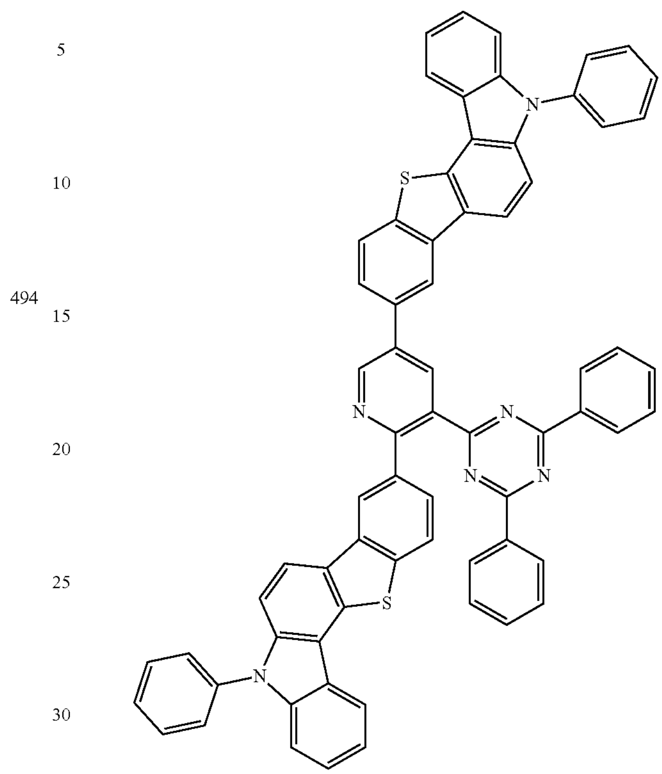
496
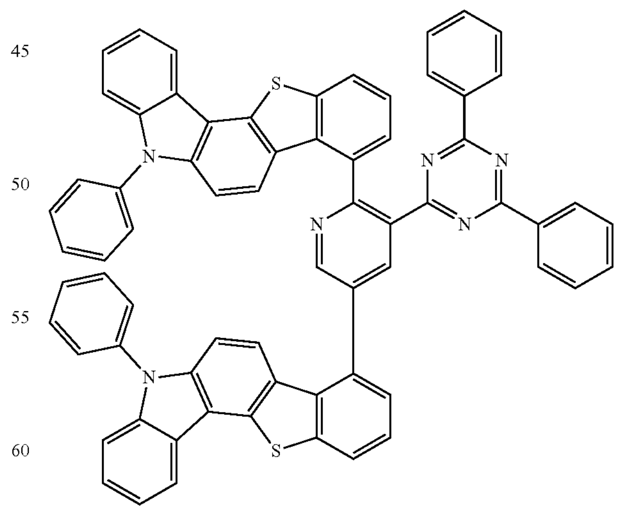

-continued
497
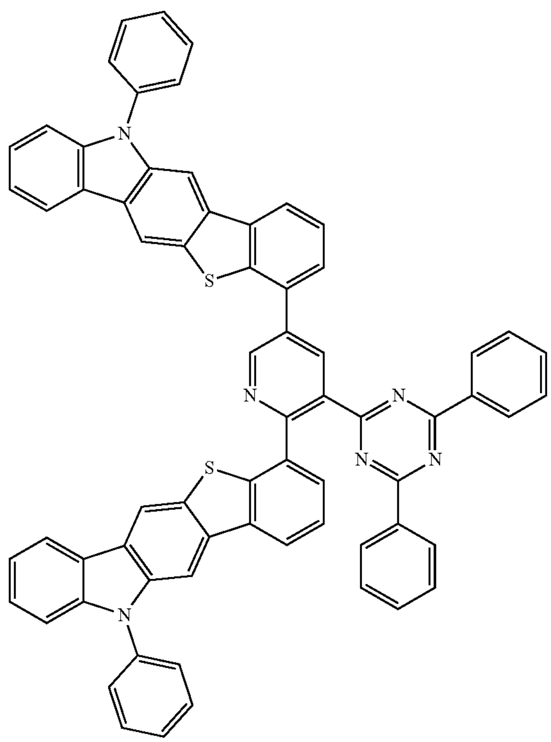
498
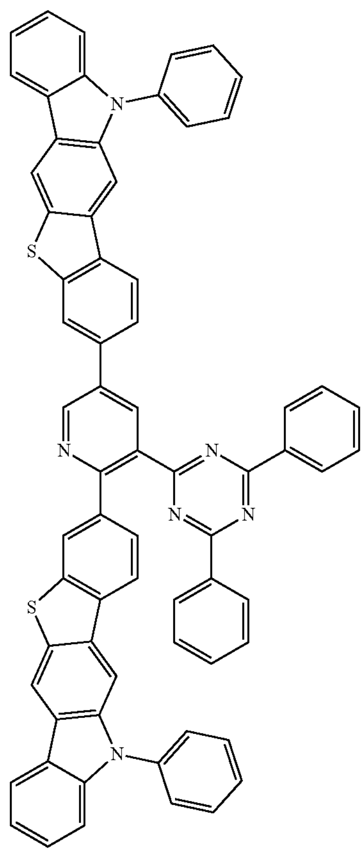
499
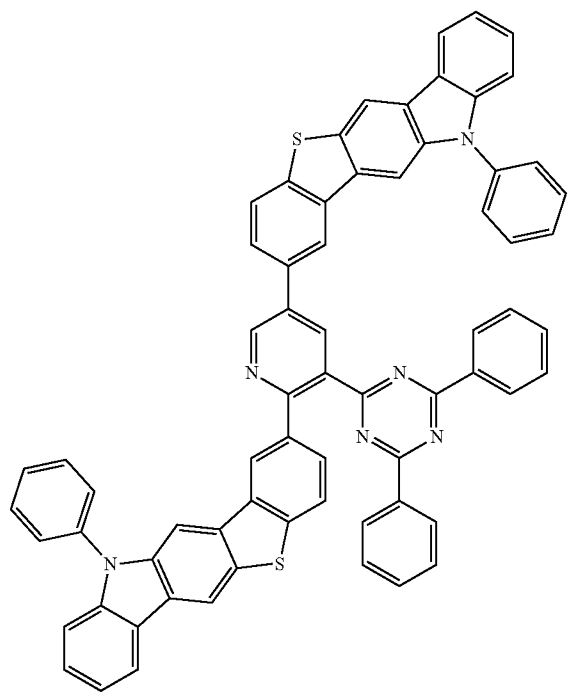
500
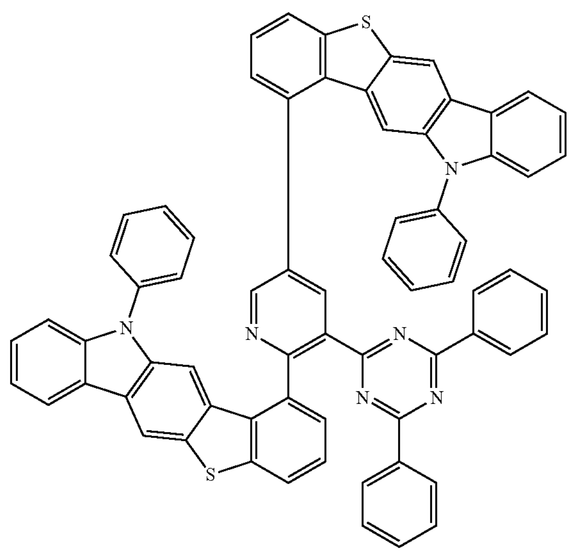

501
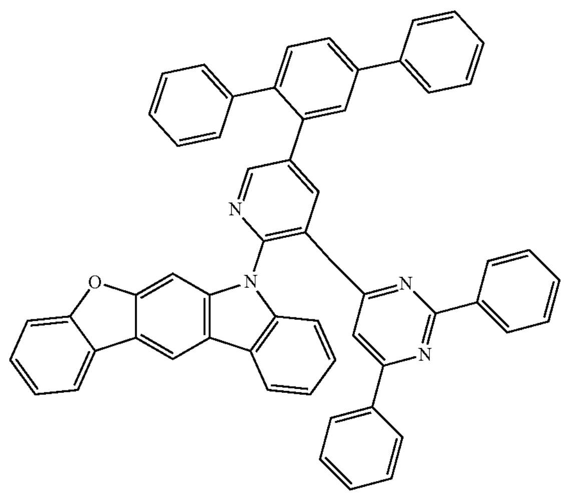
502
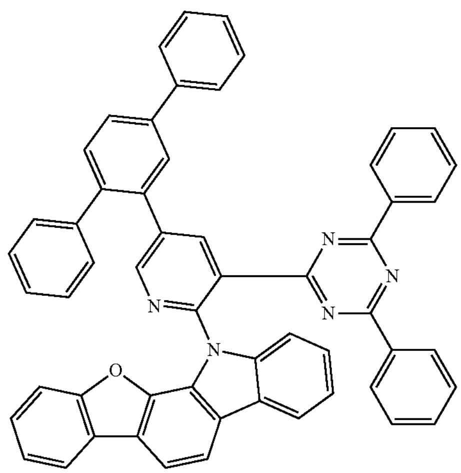
503
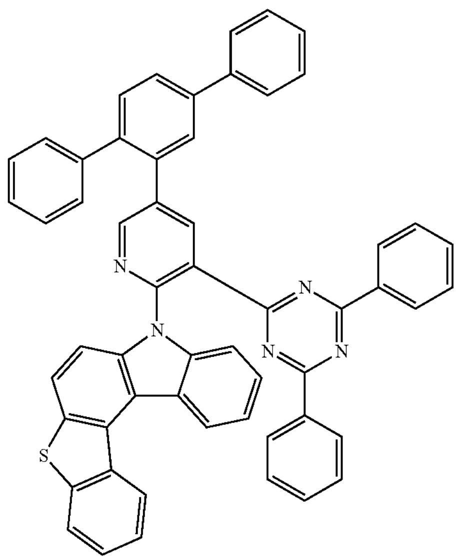
504
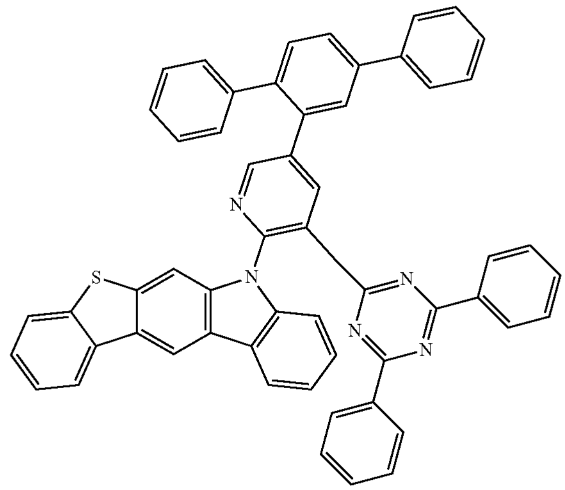
505
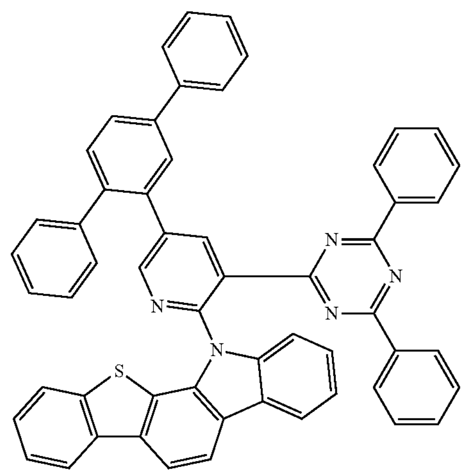
506
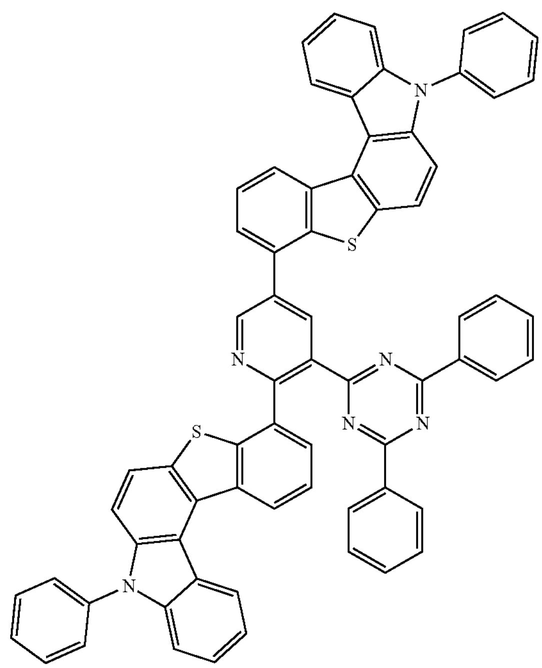

-continued
507
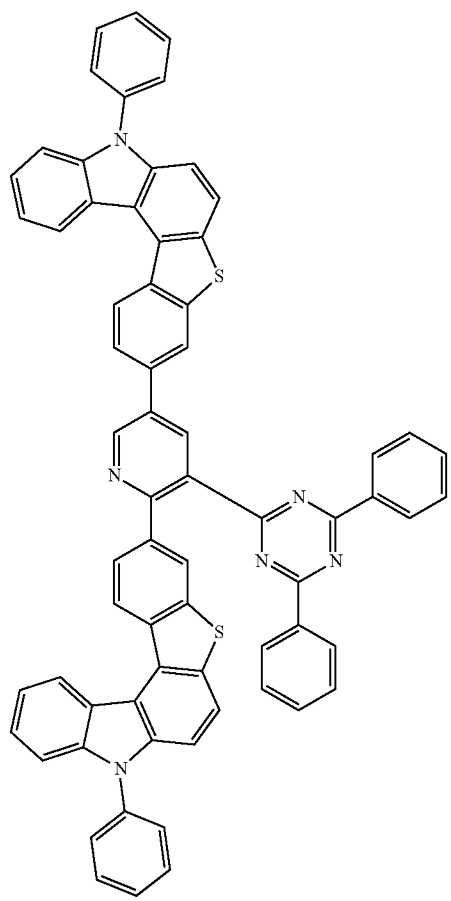
508
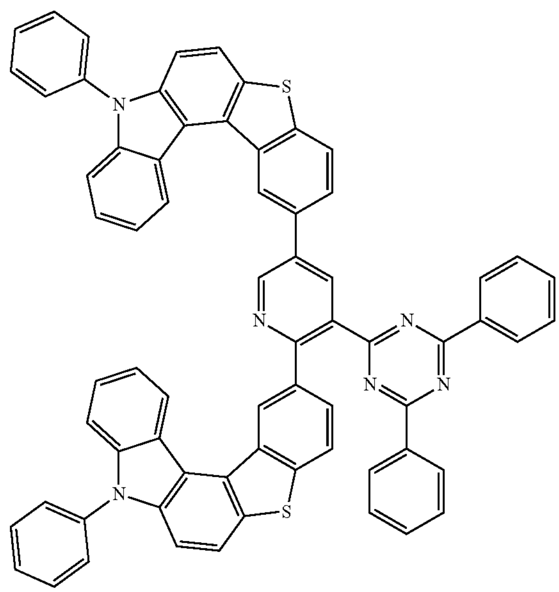
-continued
509
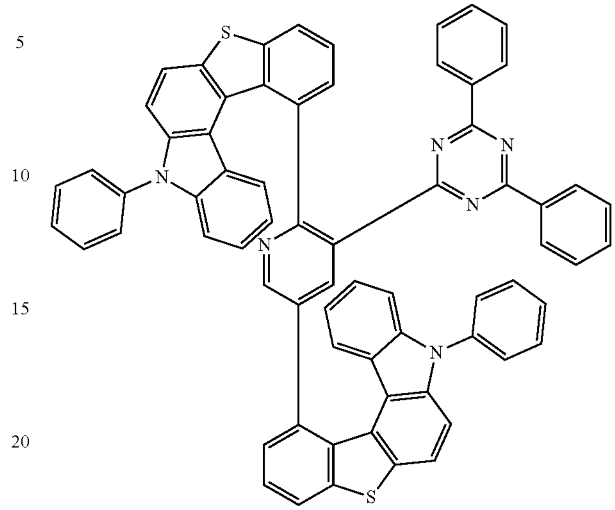
510
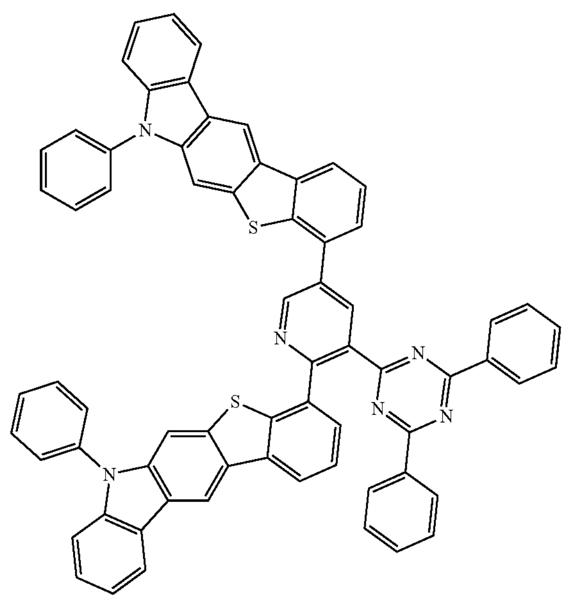

-continued
511
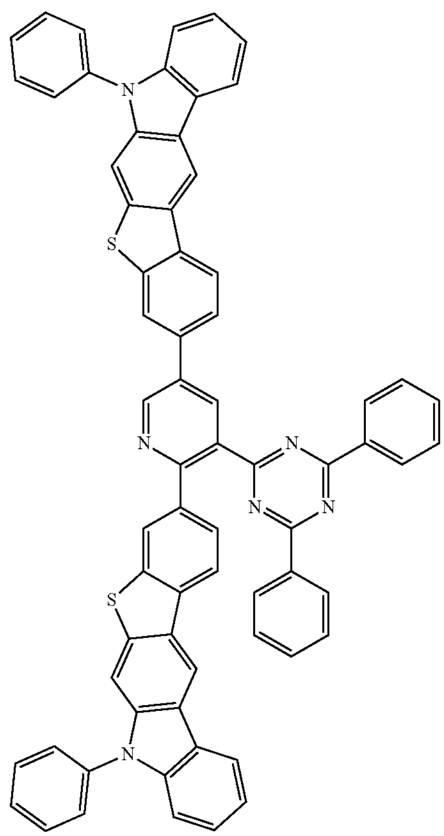
512
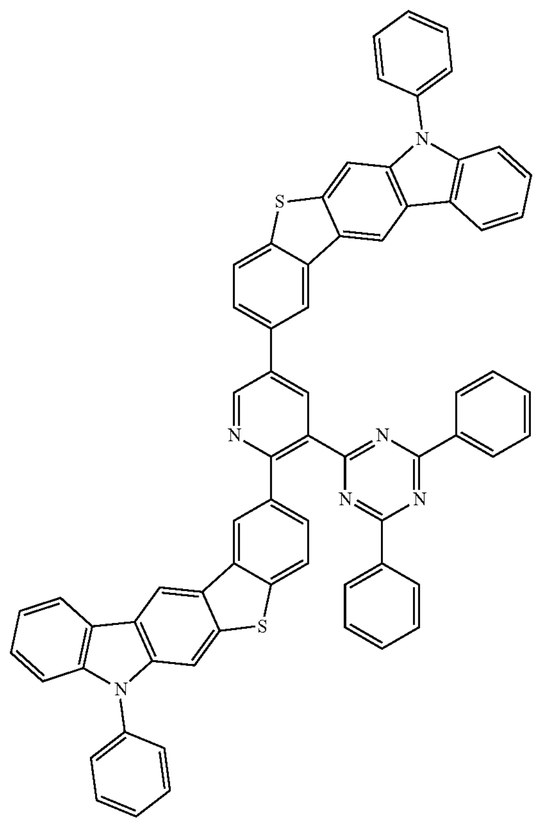
-continued
513
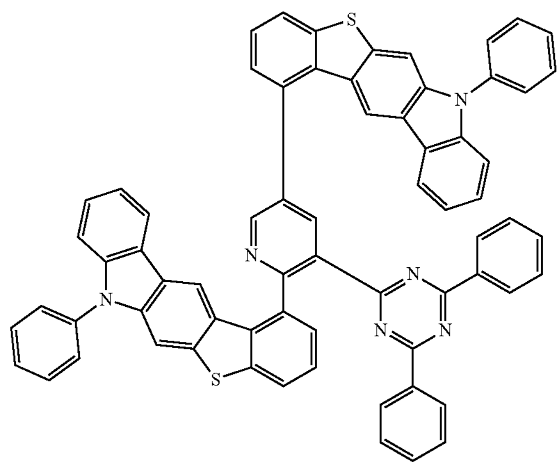
514
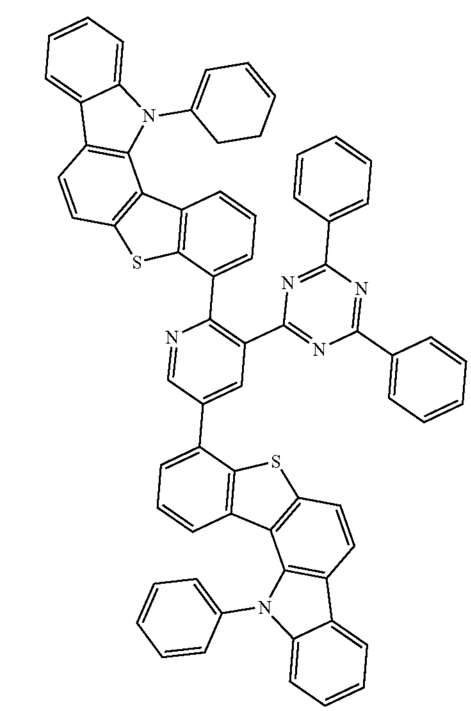

-continued
515
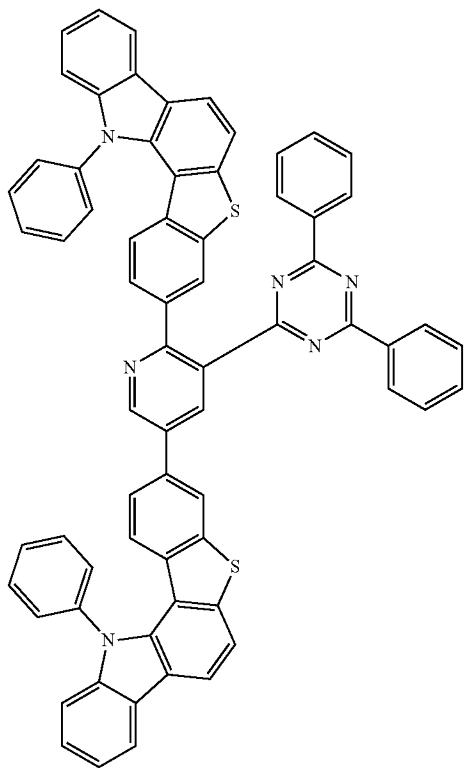
516
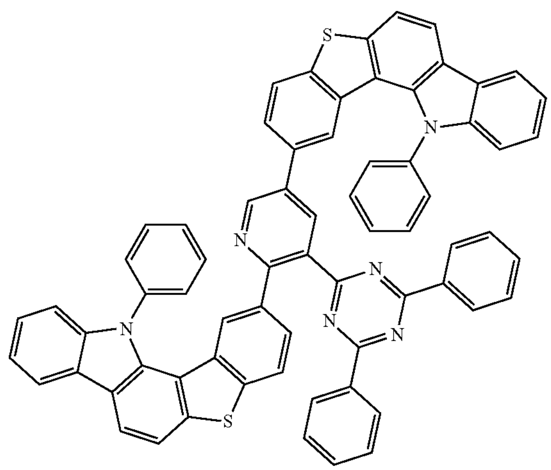
517
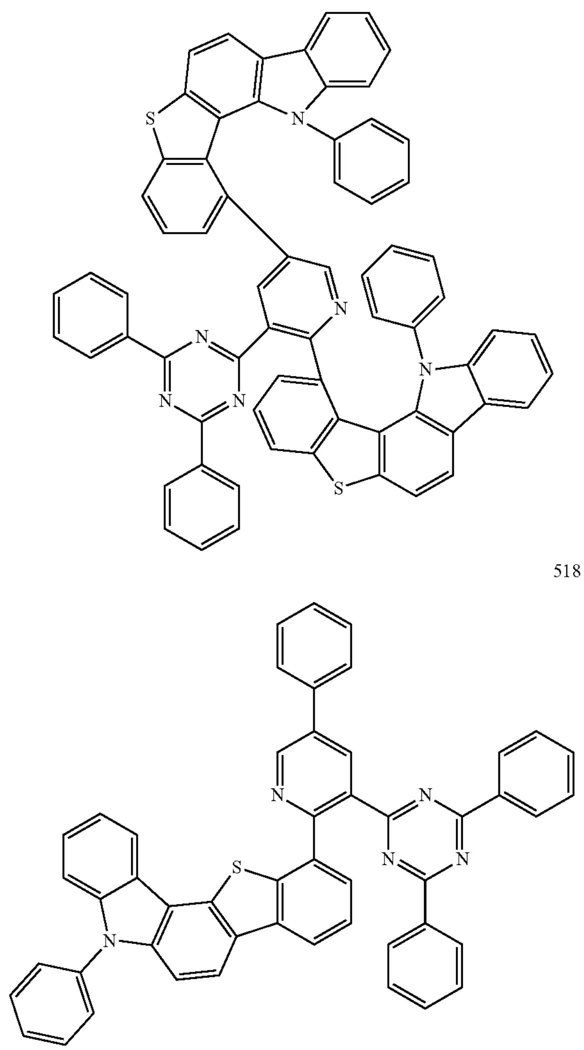
518
519
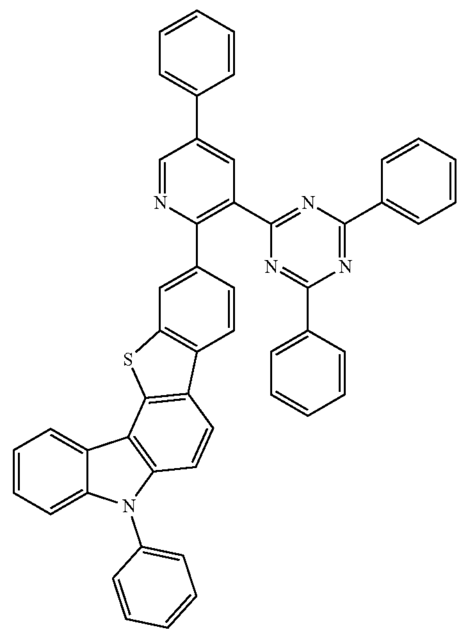

-continued
520
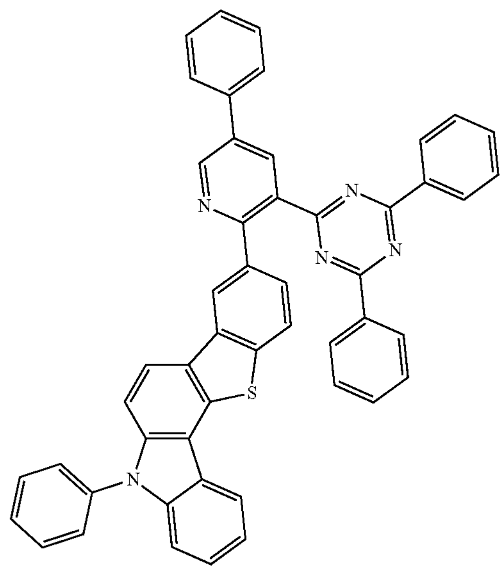
521
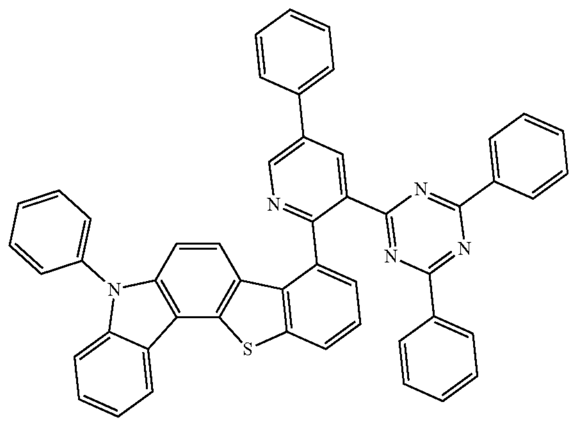
522
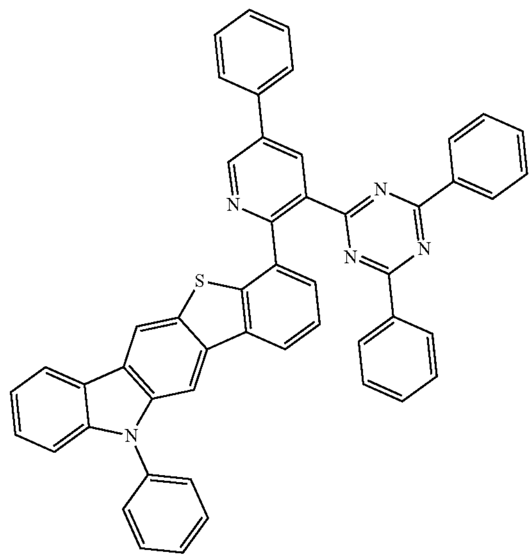
-continued
523
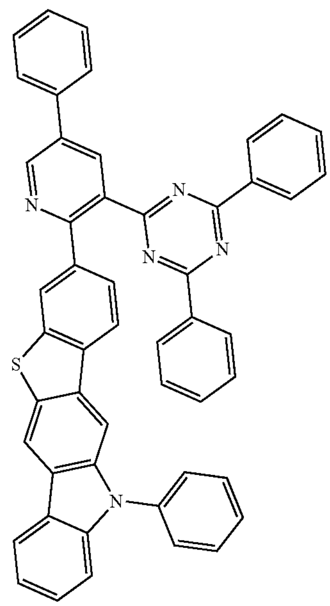
524
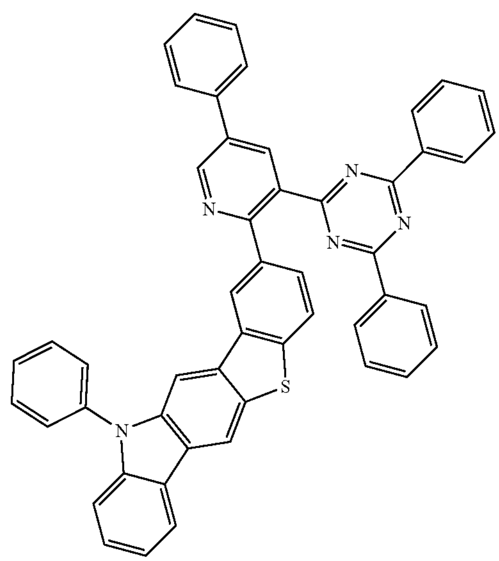
525
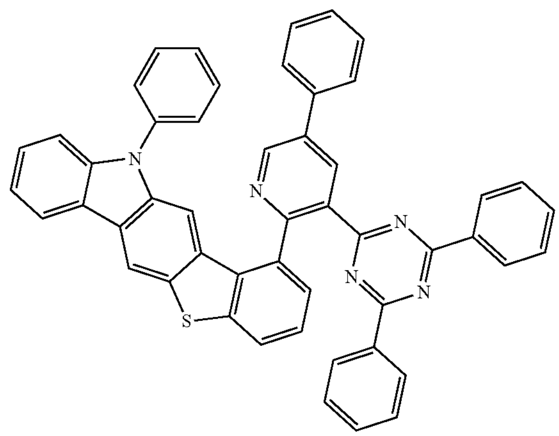

-continued
526
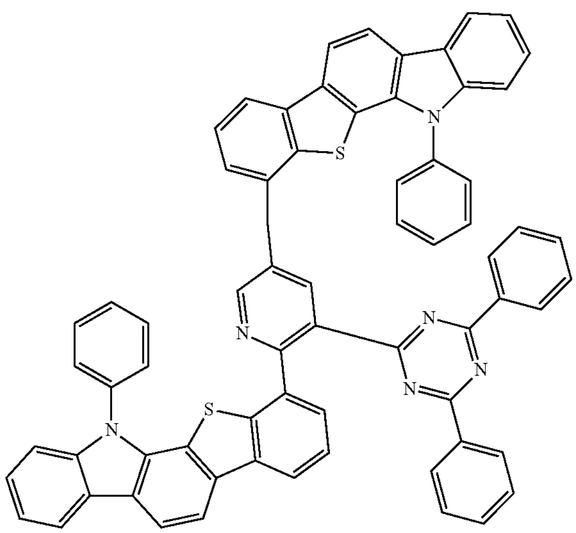
527
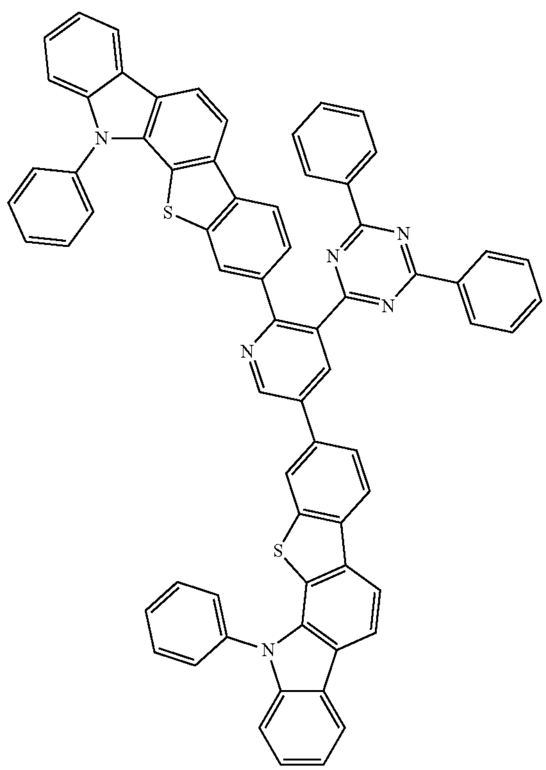
-continued
528
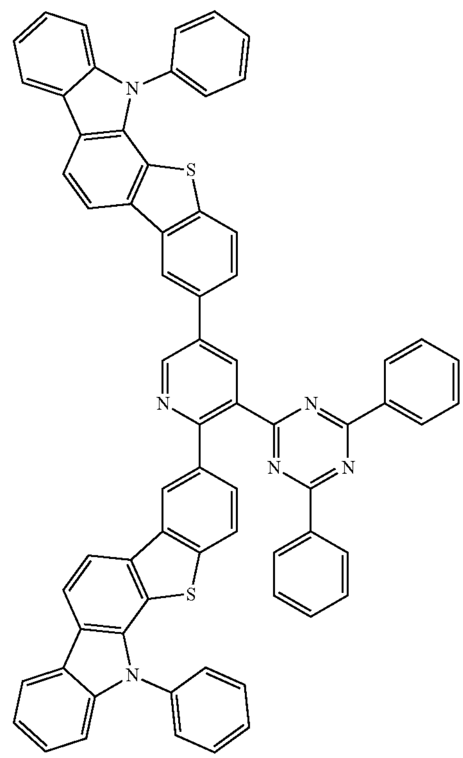
529
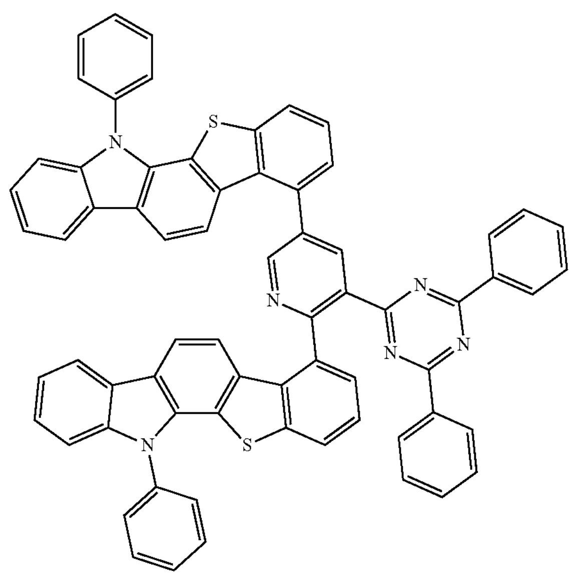

-continued
530
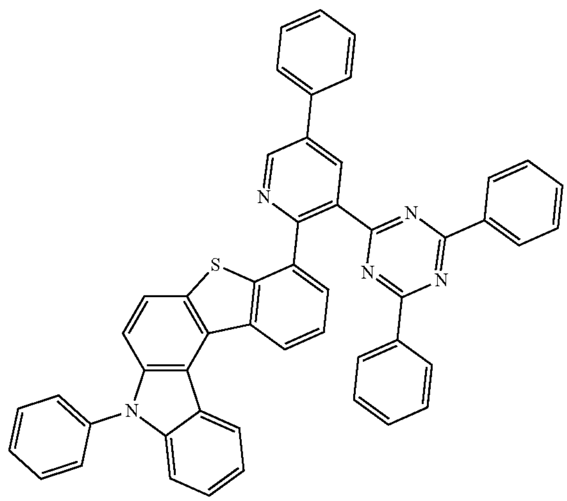
531
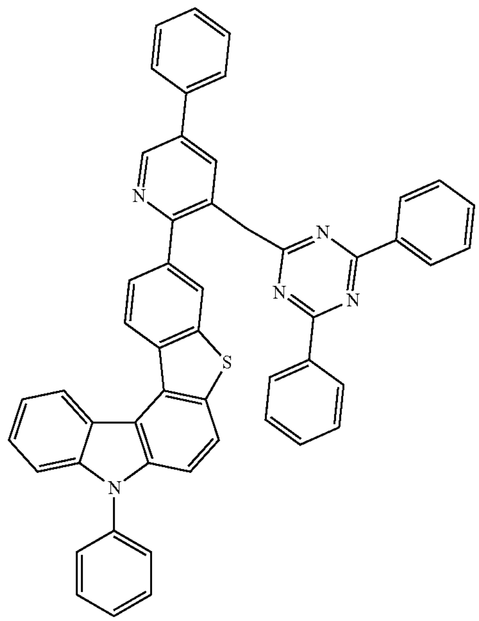
532
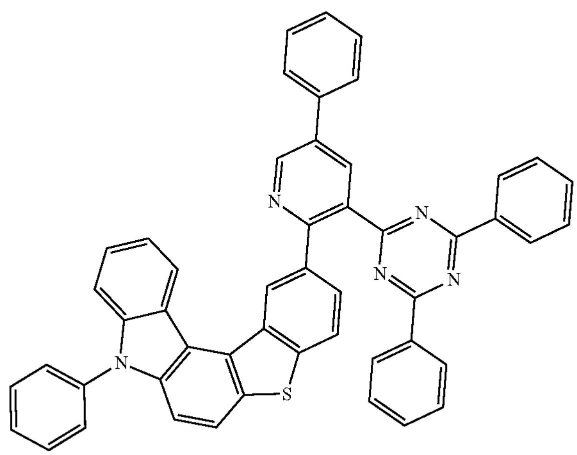
-continued
533
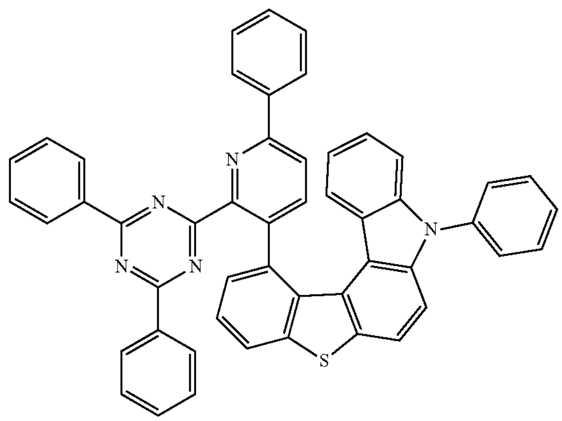
534
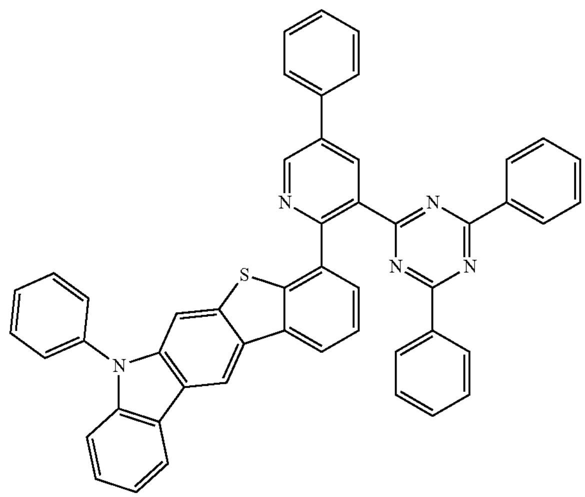
535
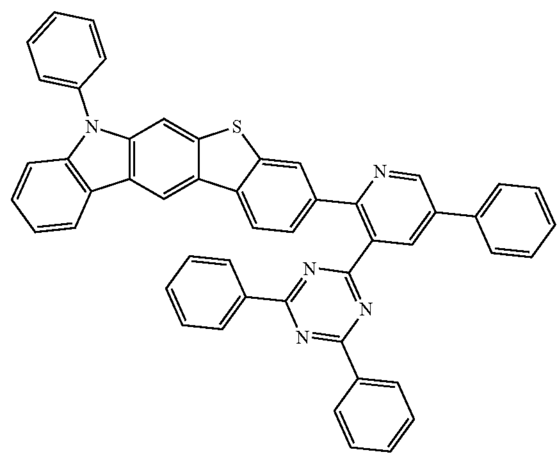

-continued
536
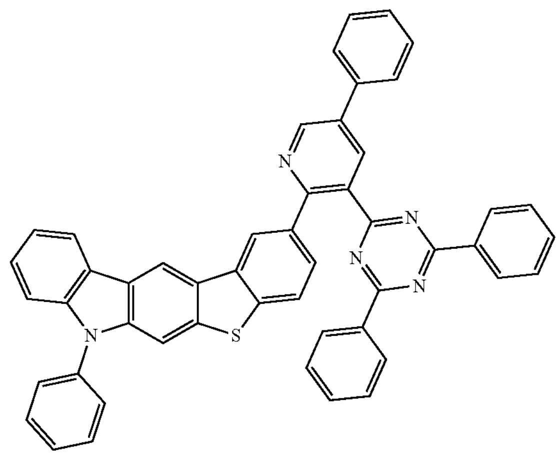
537
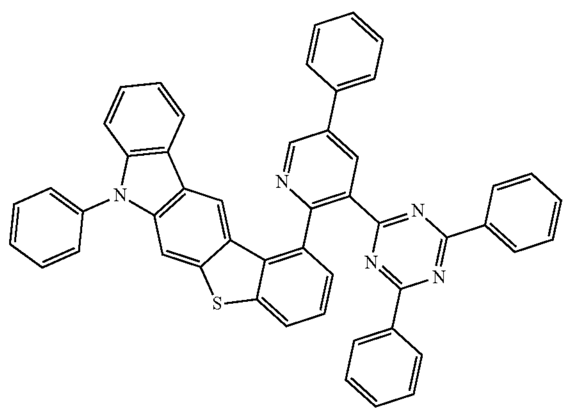
538
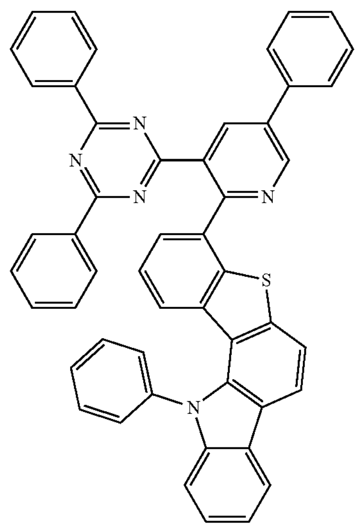
-continued
539
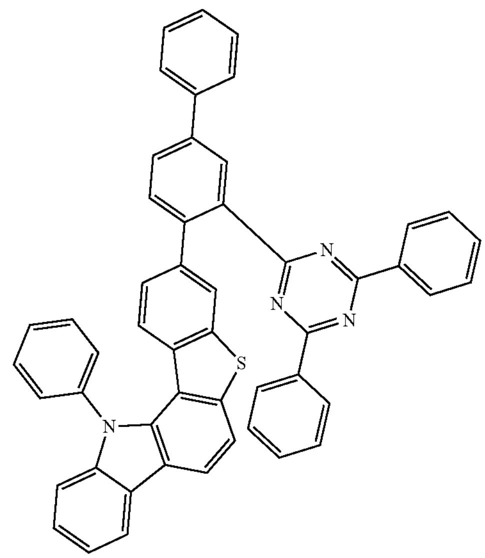
540
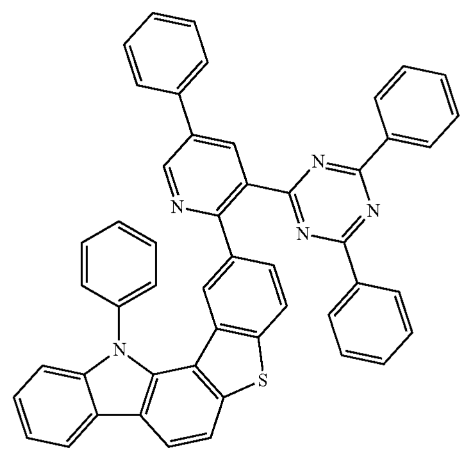
541
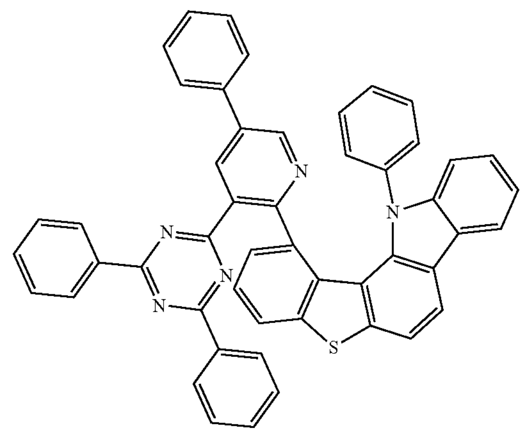

-continued
542
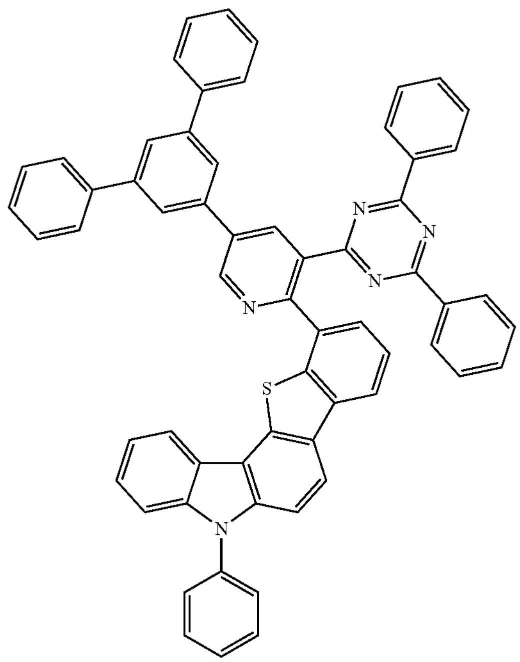
543
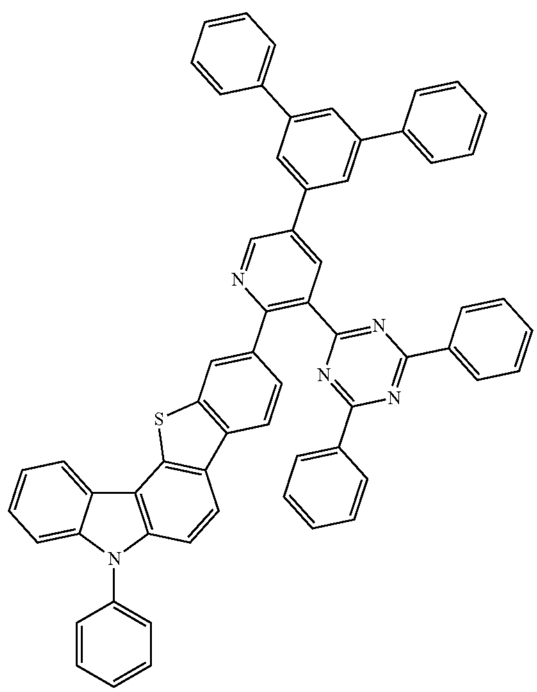
-continued
544
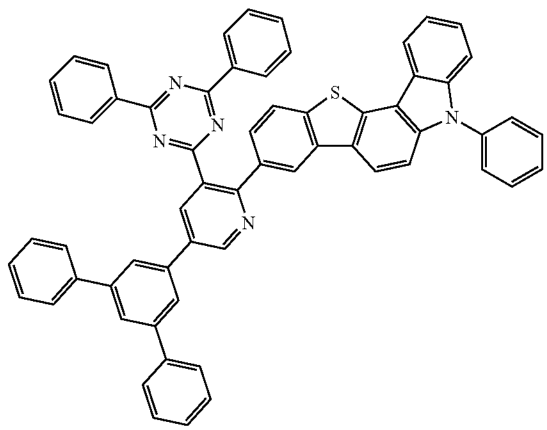
545
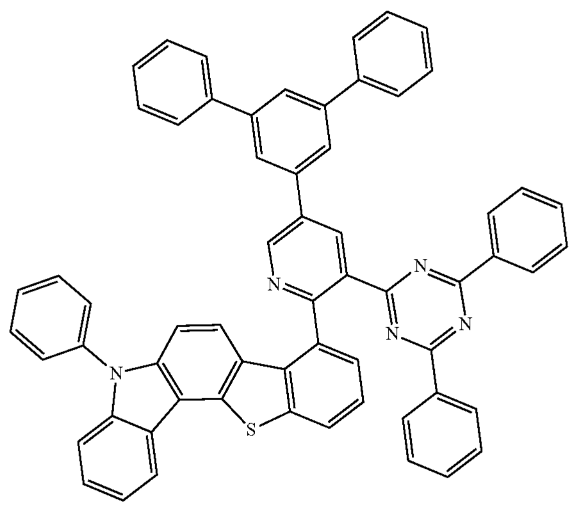
546
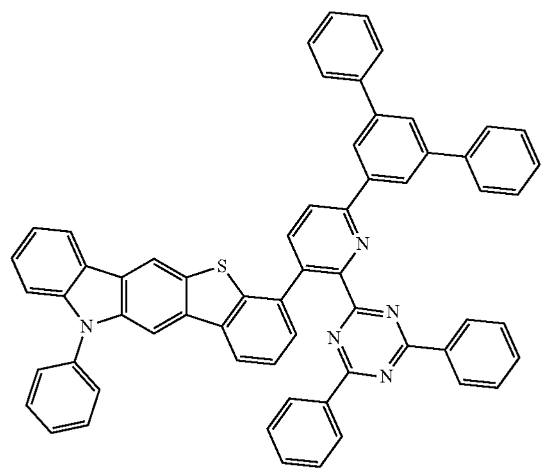

-continued
547
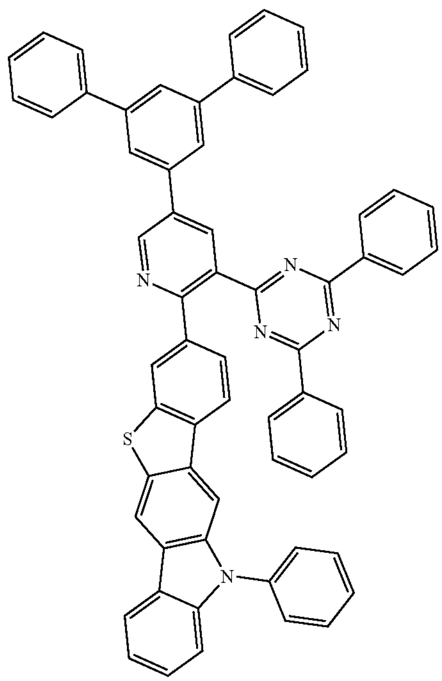
548
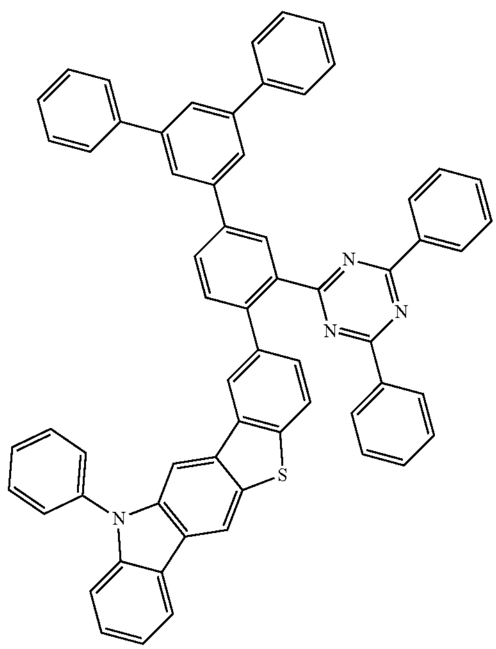
-continued
449
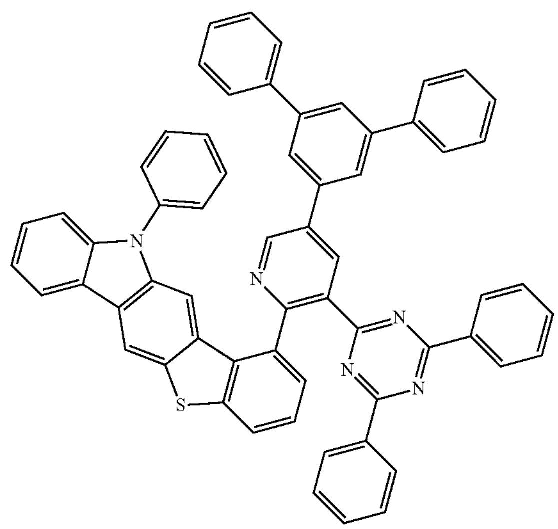
550
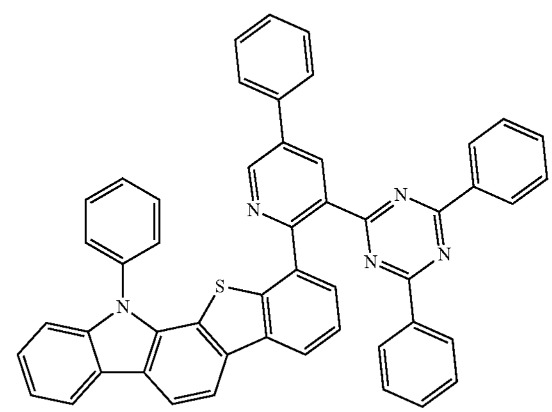
551
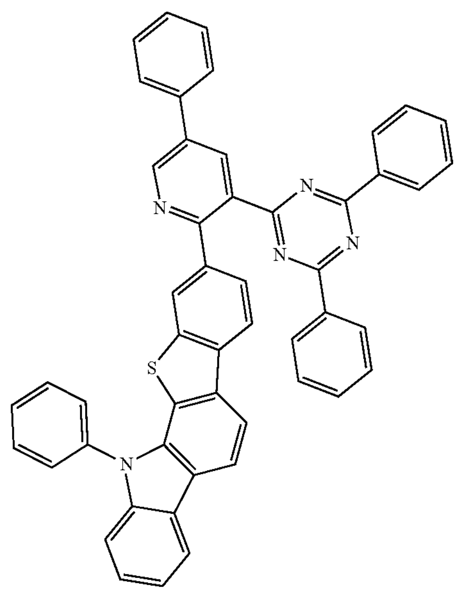

-continued
552
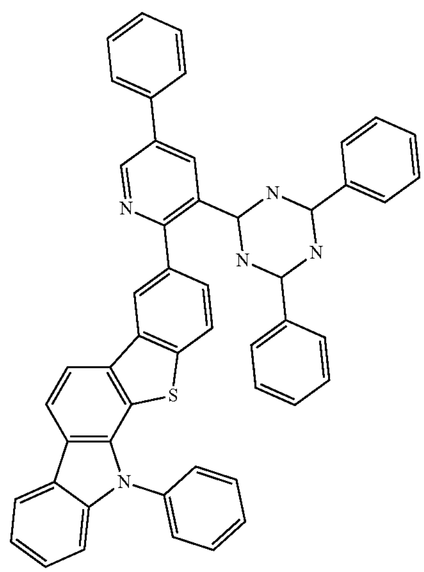
553
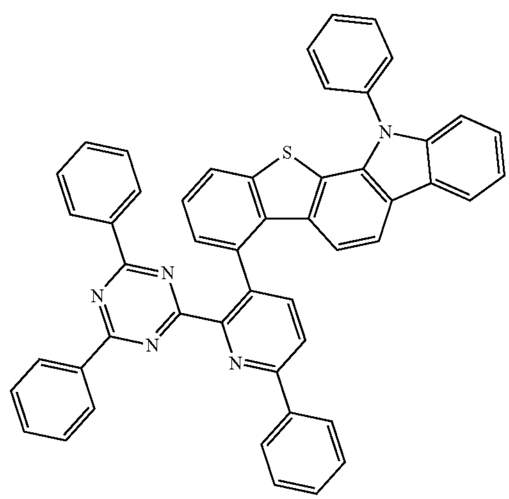
554
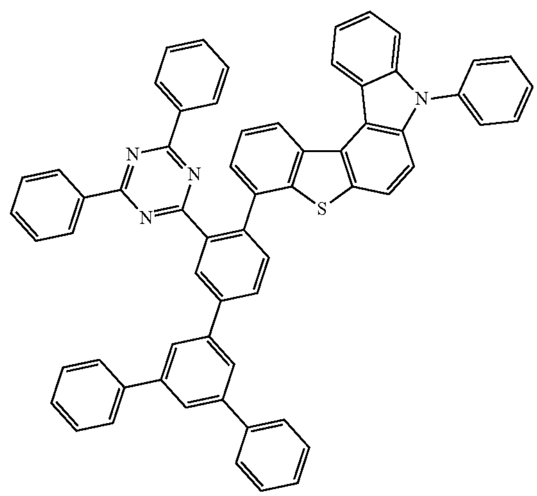
-continued
555
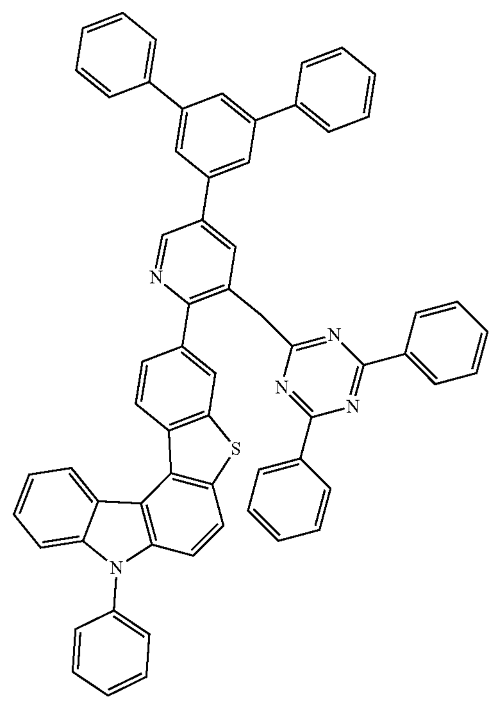
556
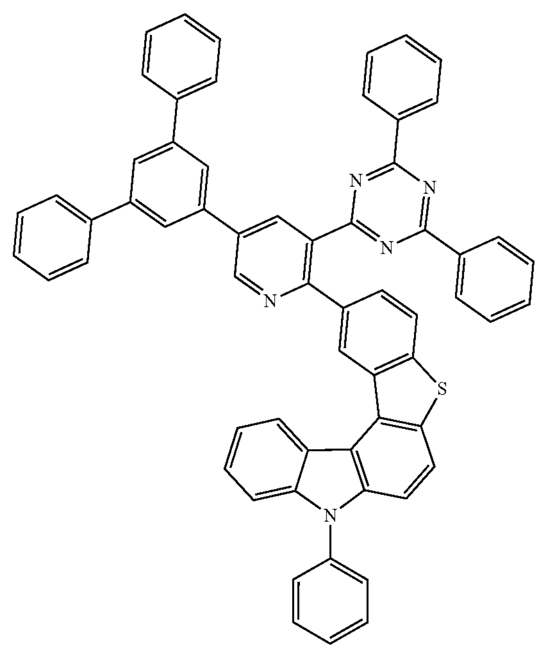

-continued
557
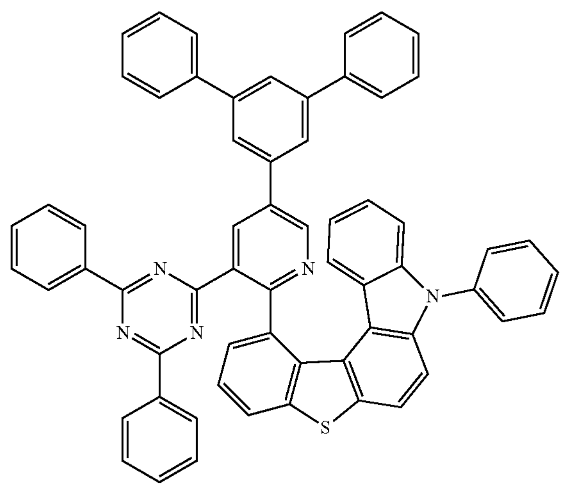
558
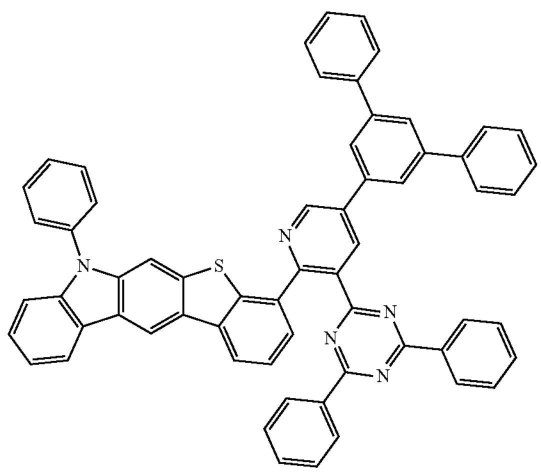
559
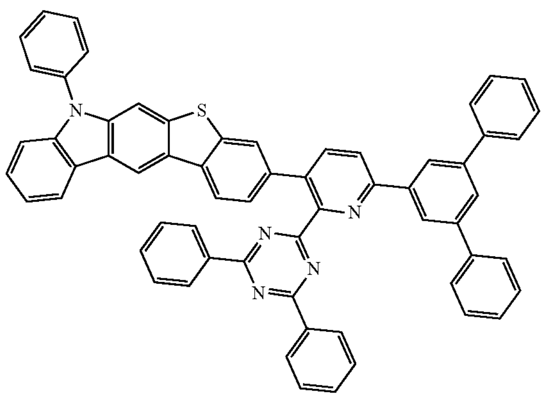
-continued
560
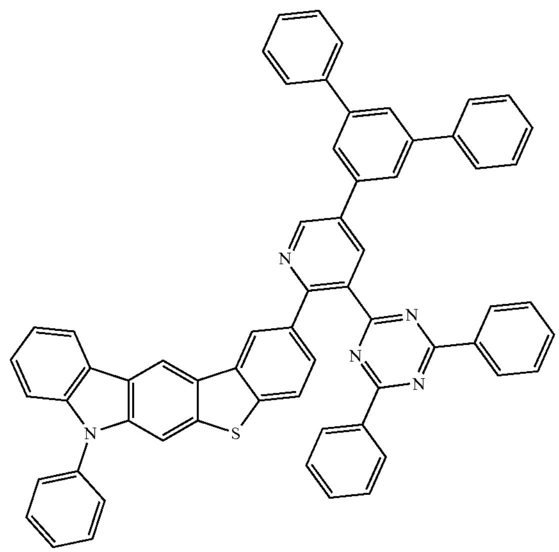
561
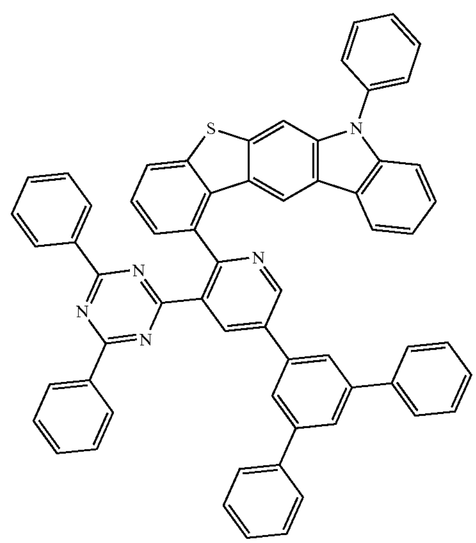
562
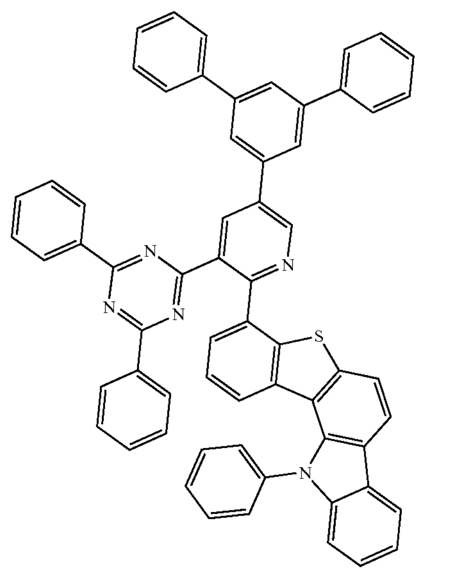

-continued
563
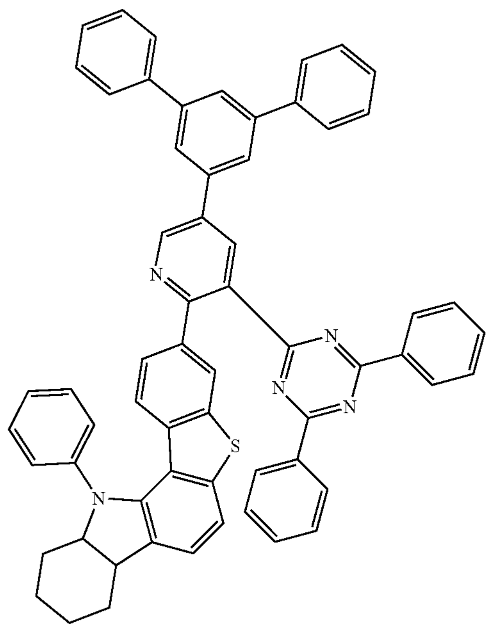
564
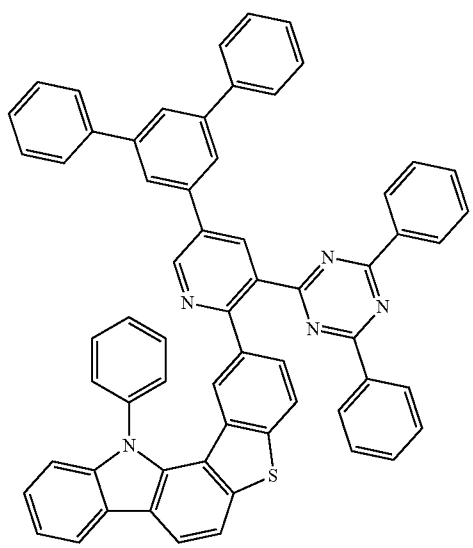
-continued
565
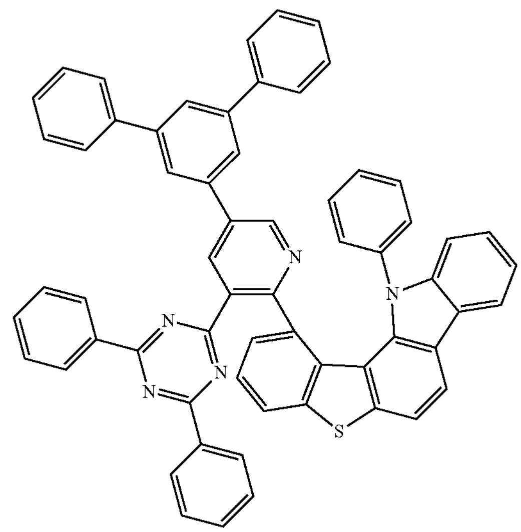
566
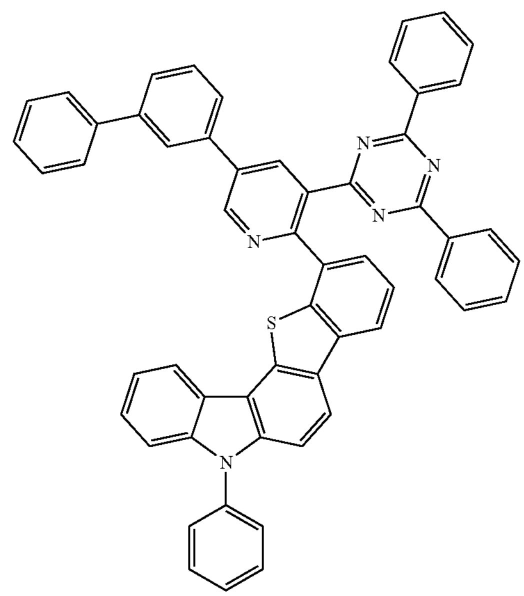

-continued
567
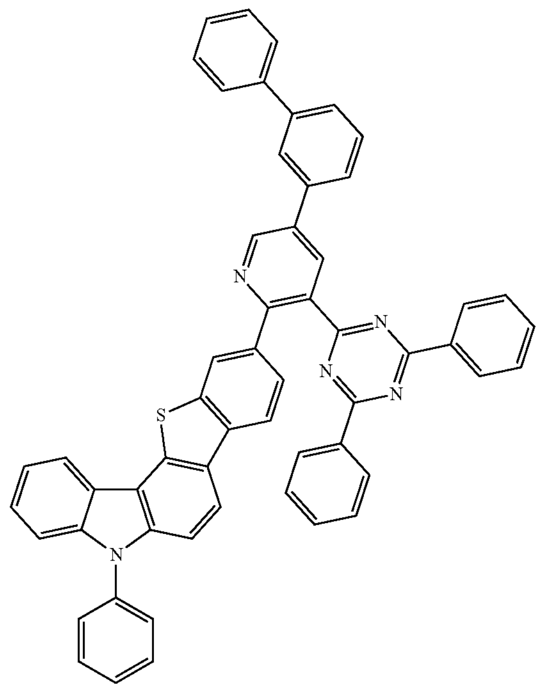
568
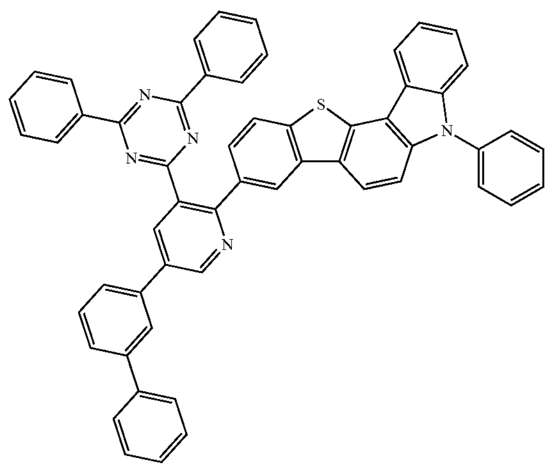
569
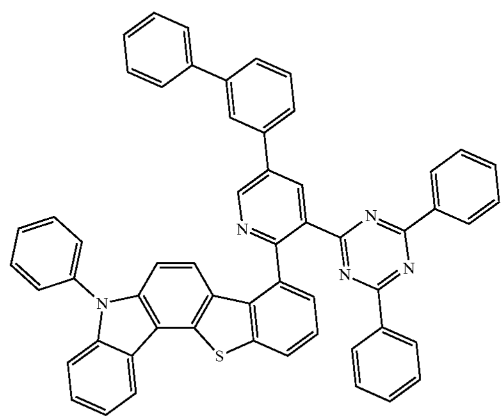
-continued
570
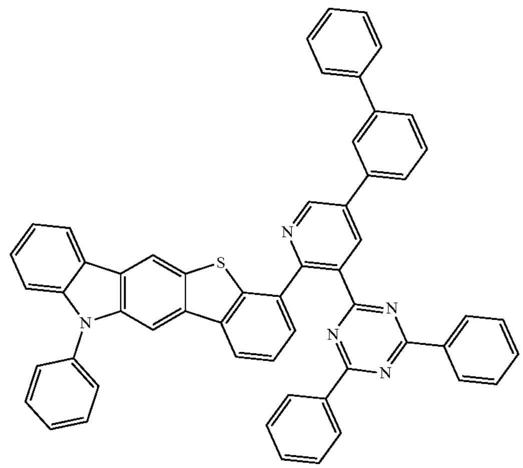
571
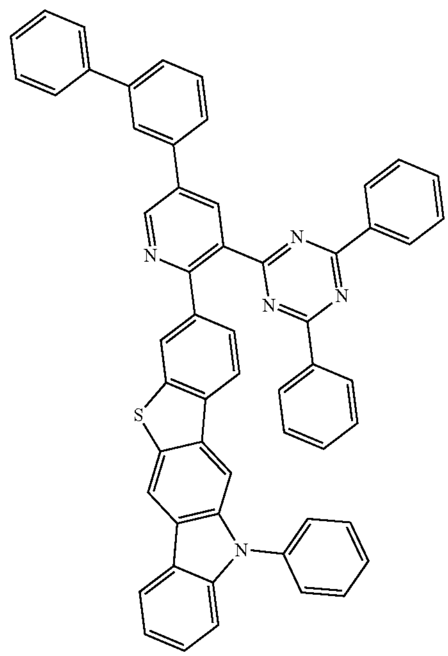

-continued
572
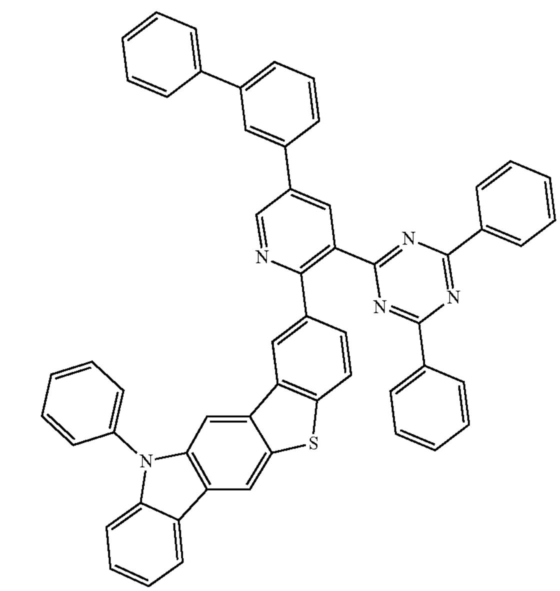
573
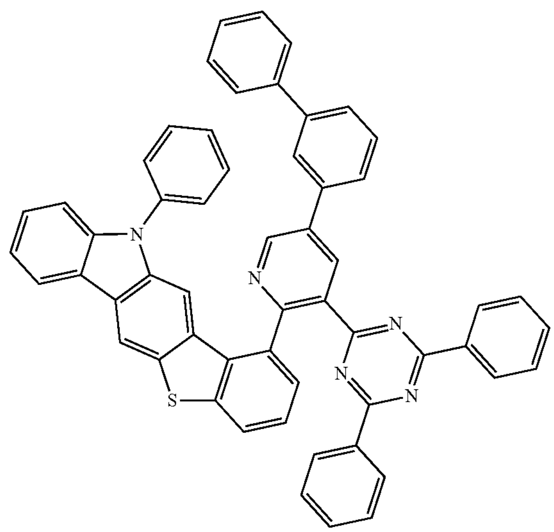
574
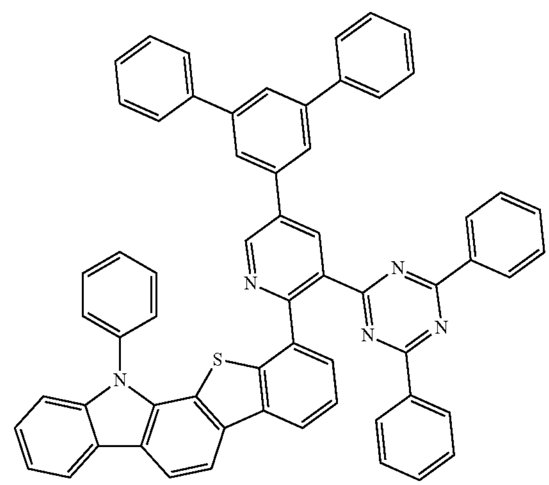
-continued
575
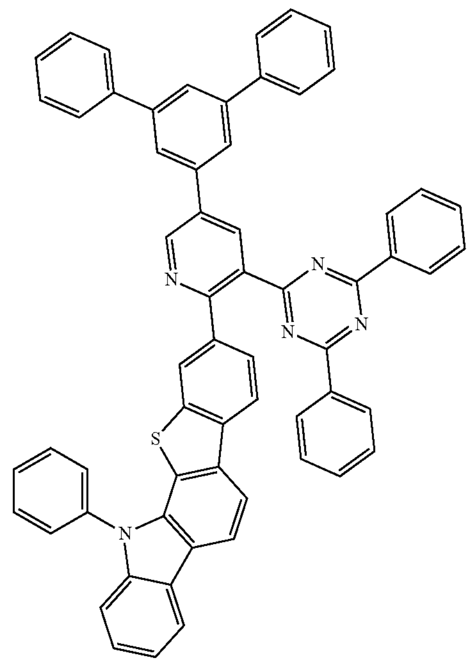
576
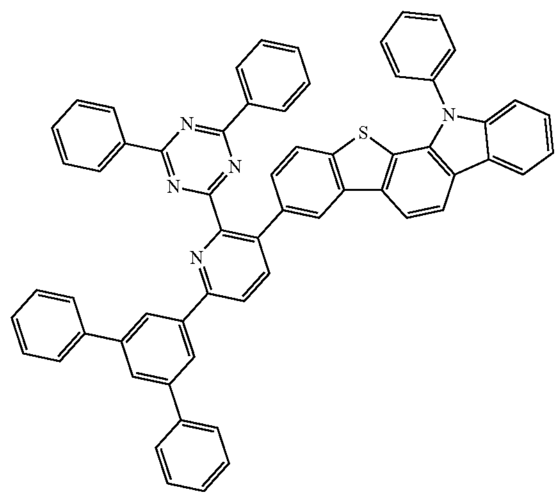

-continued
577
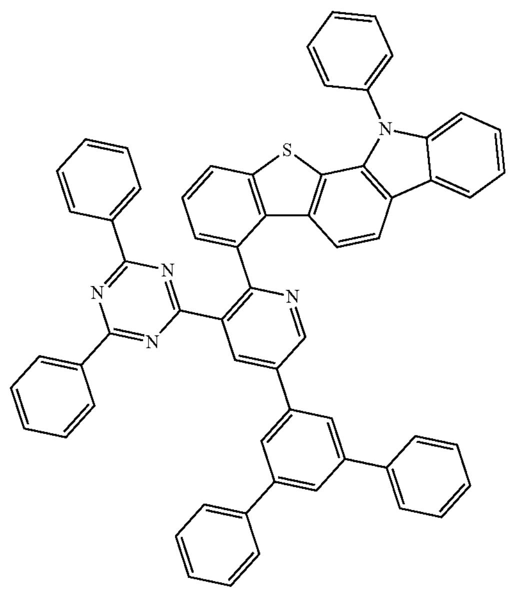
p
578
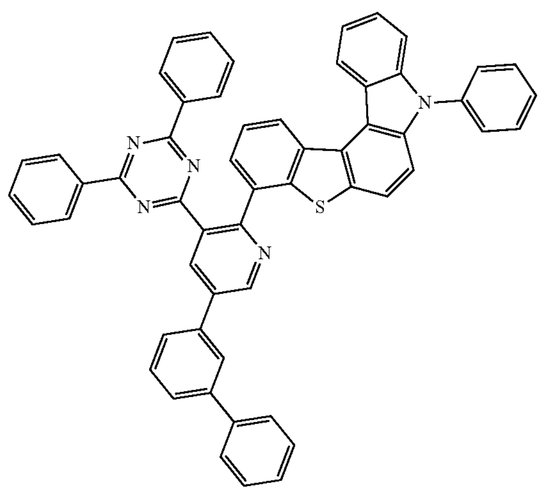
-continued
579
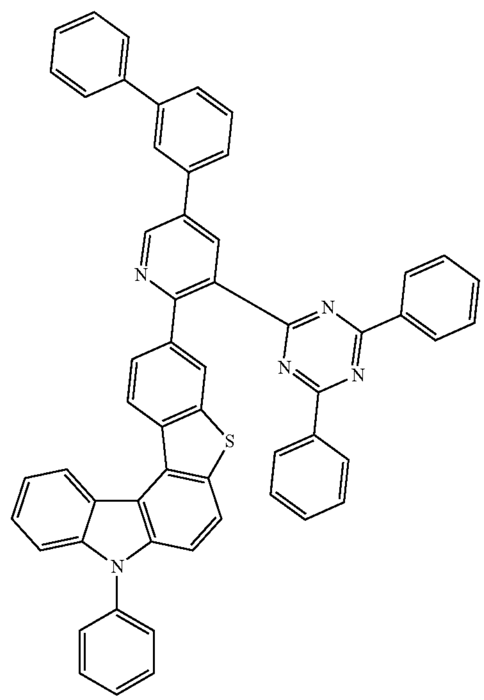
580
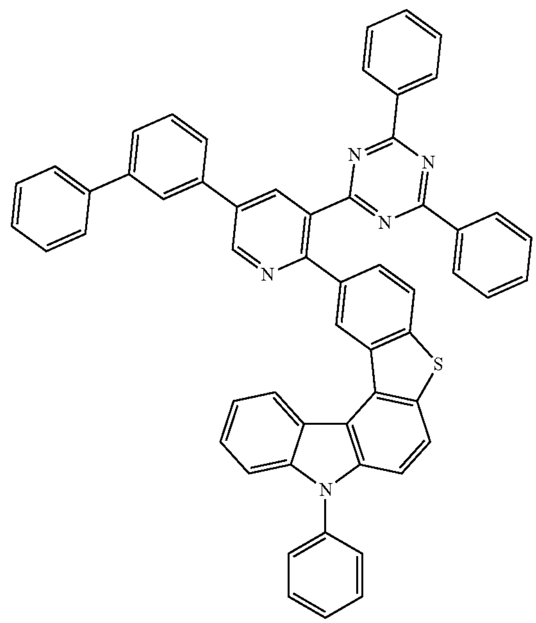

-continued
581
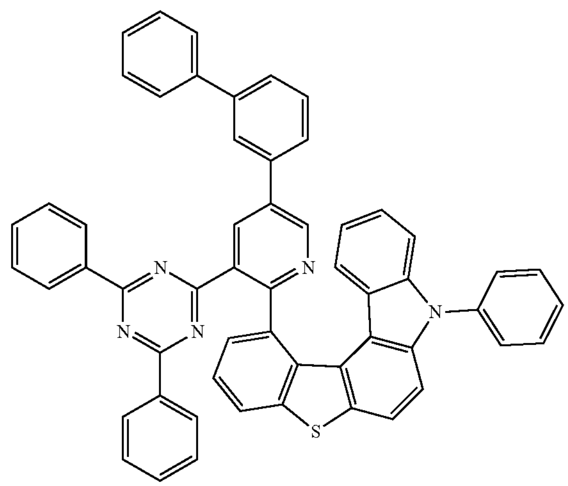
582
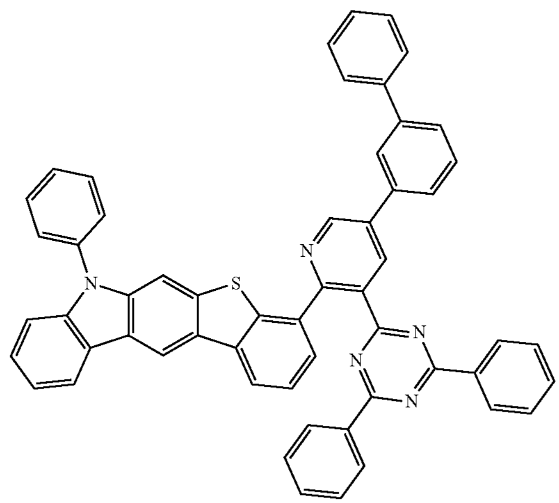
583
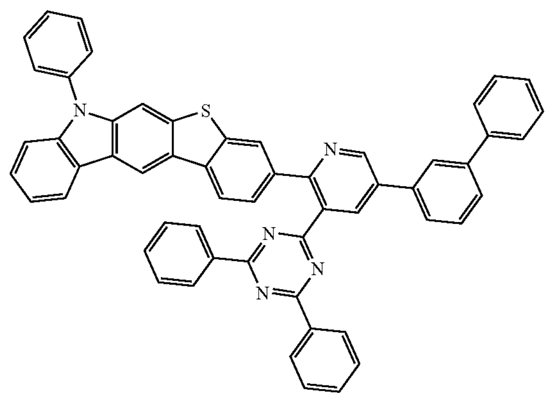
-continued
584
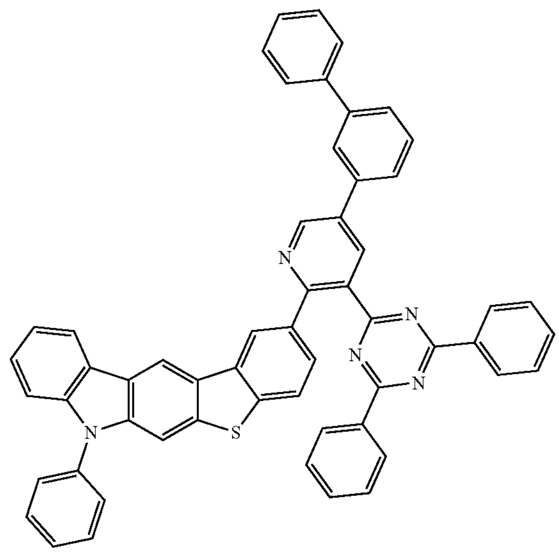
585
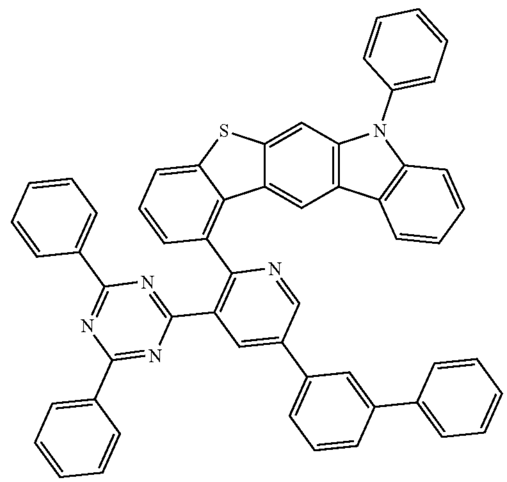
586
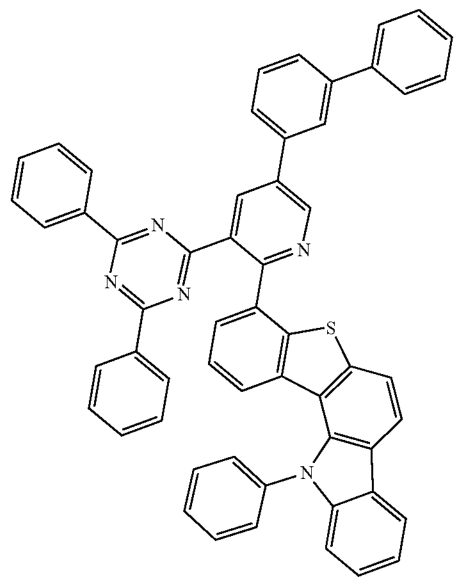

-continued
587
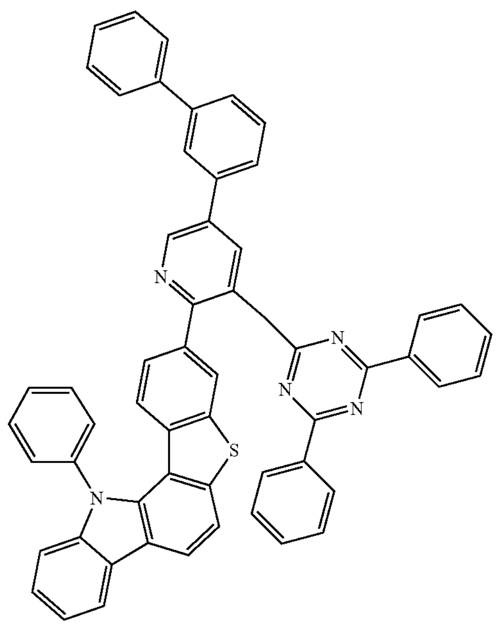
588
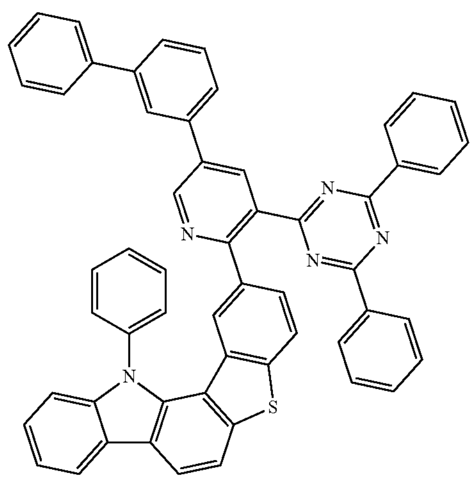
589
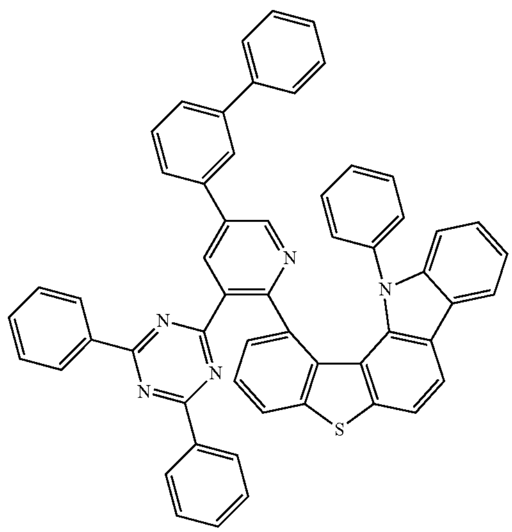
-continued
590
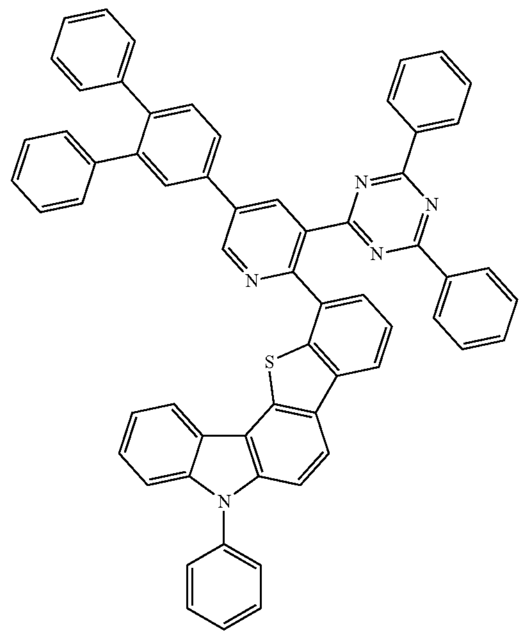
591
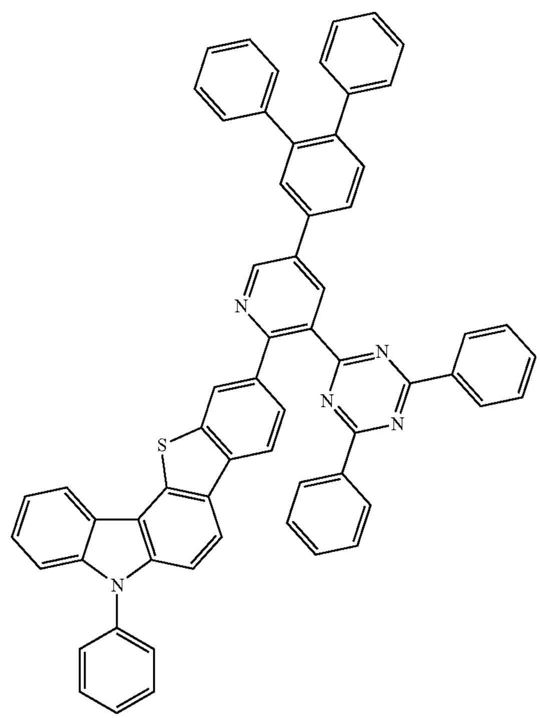

-continued
592
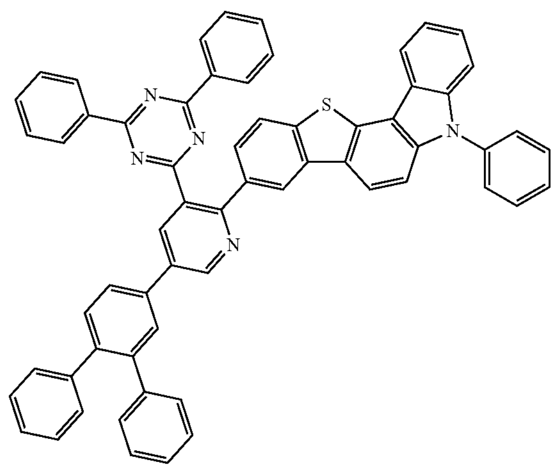
593
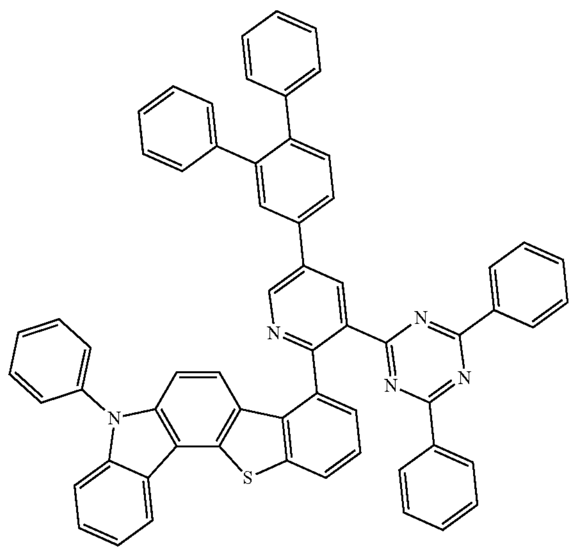
594
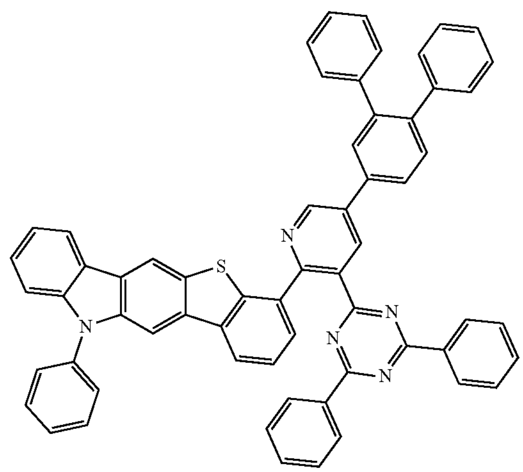
-continued
595
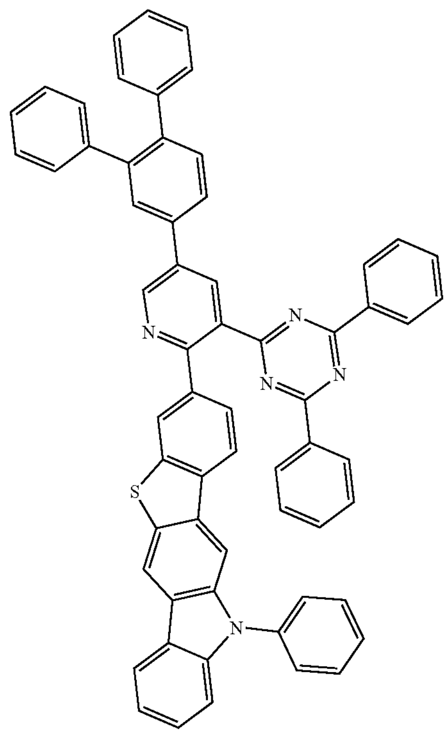
596
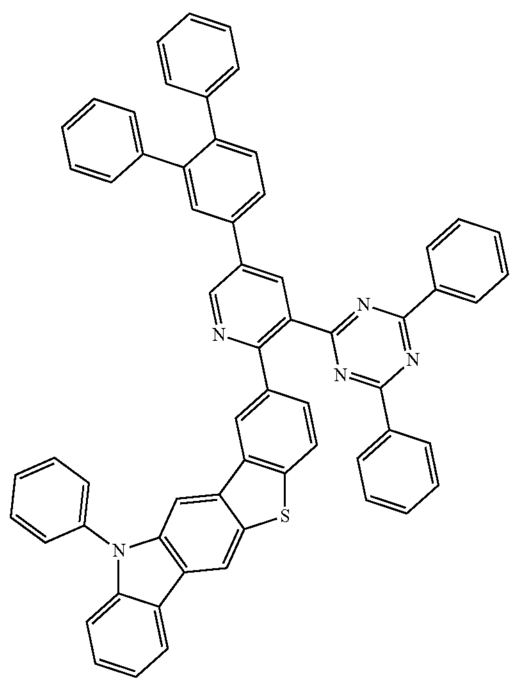

-continued
597
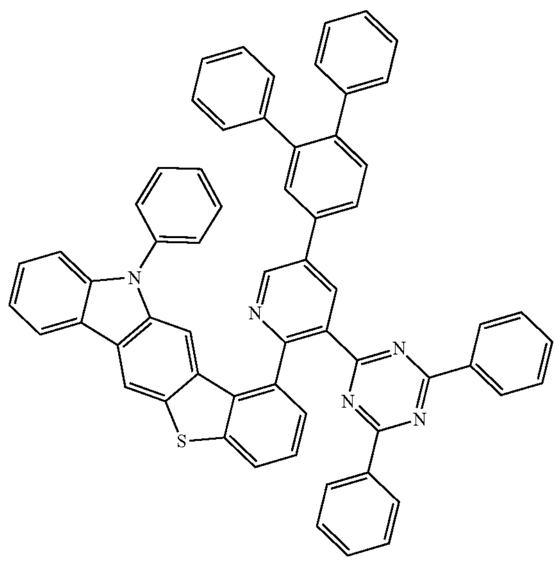
598
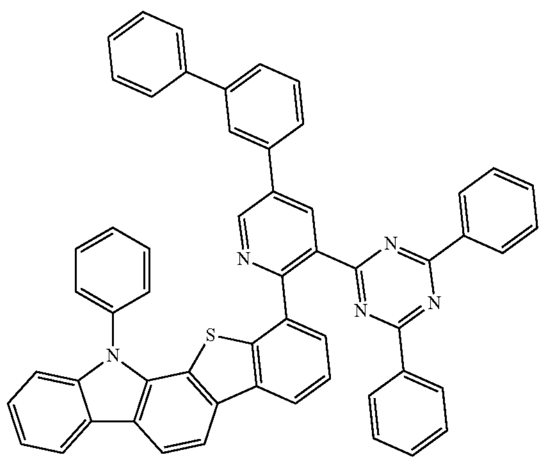
-continued
599
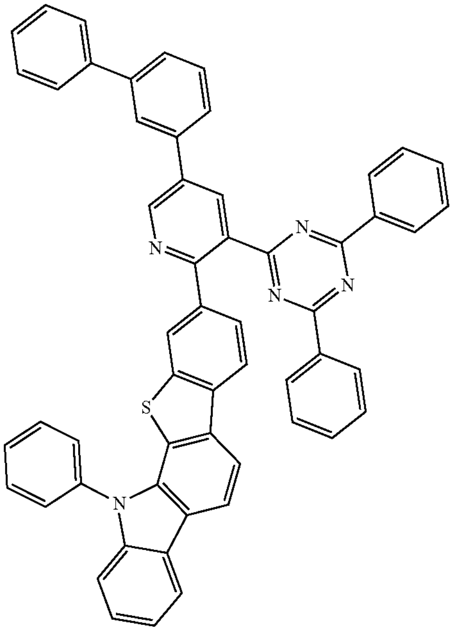
600
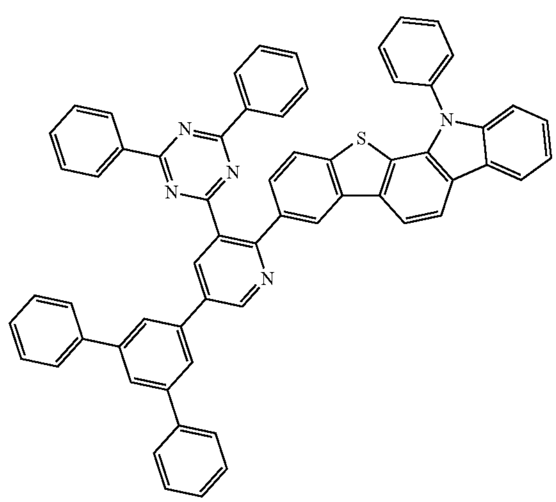

-continued
601
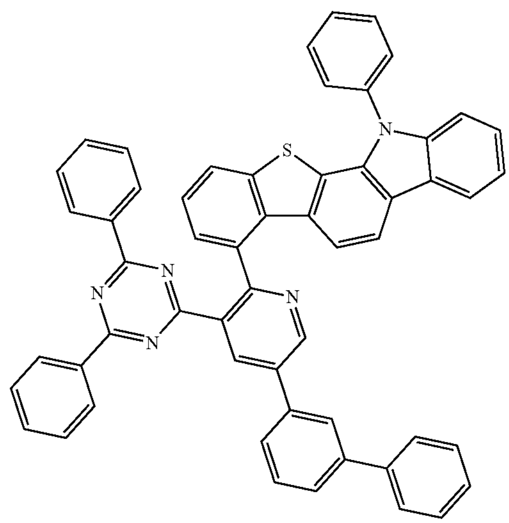
602
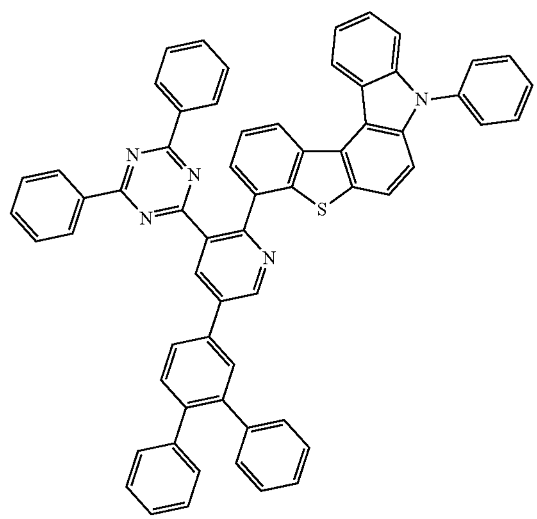
-continued
603
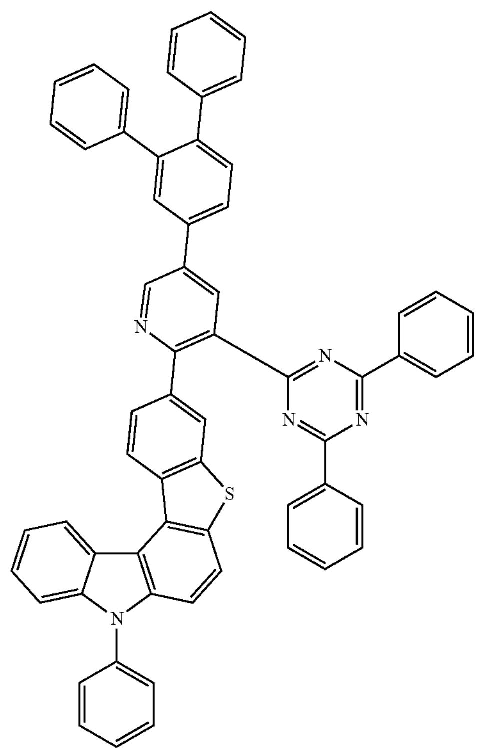
604
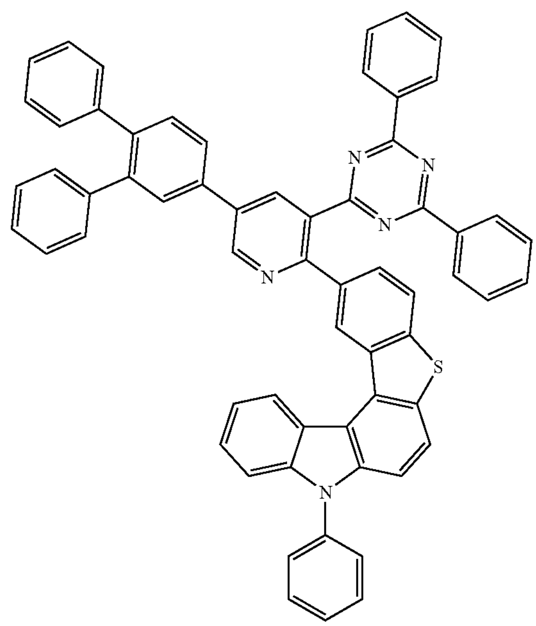

-continued
605
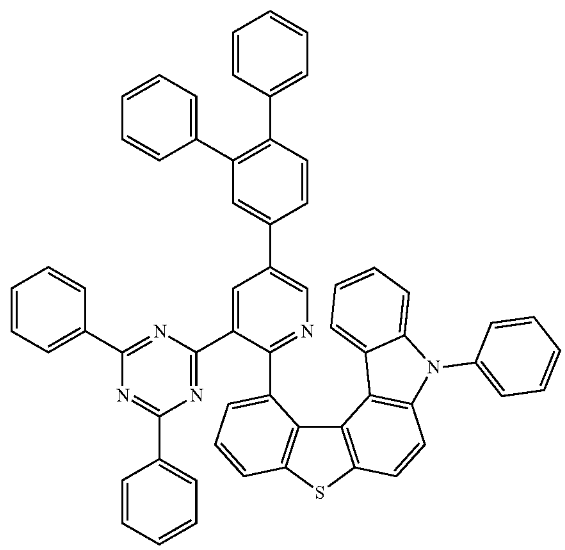
606
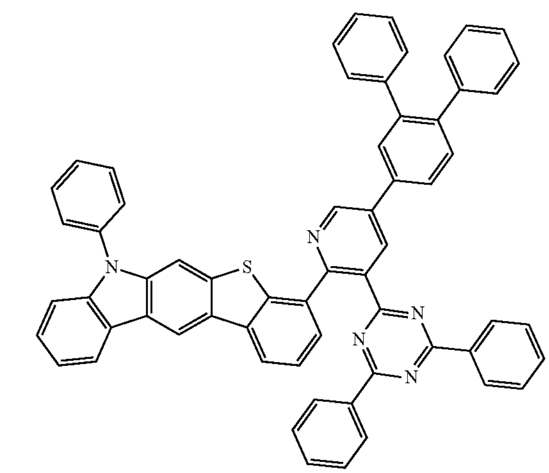
607
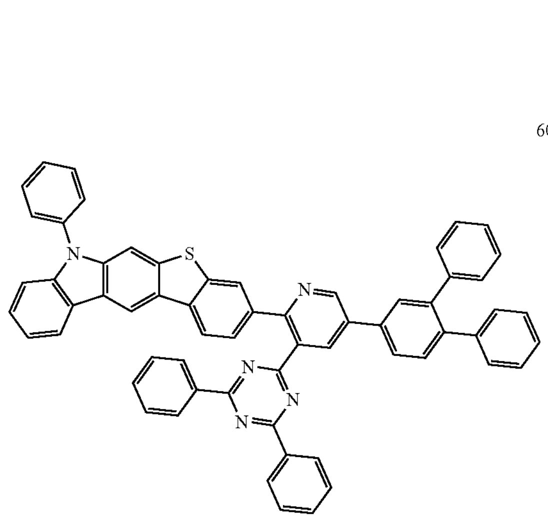
-continued
608
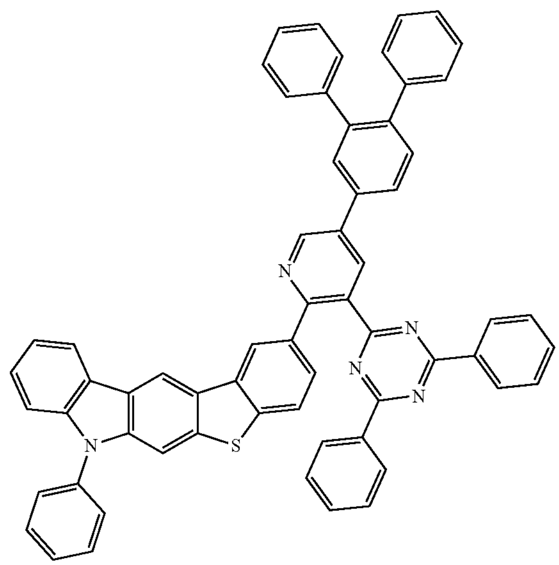
609
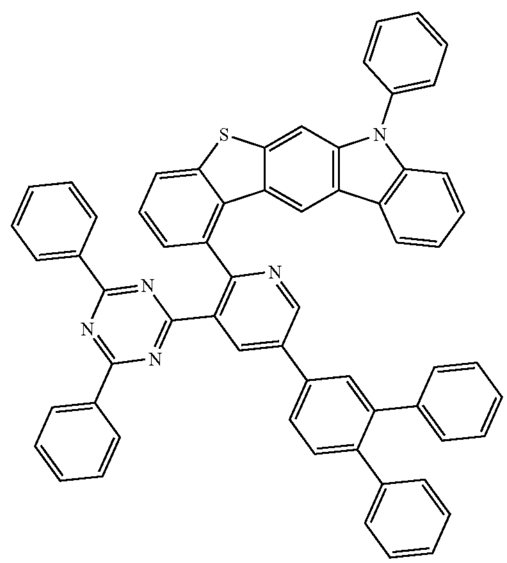

-continued
610
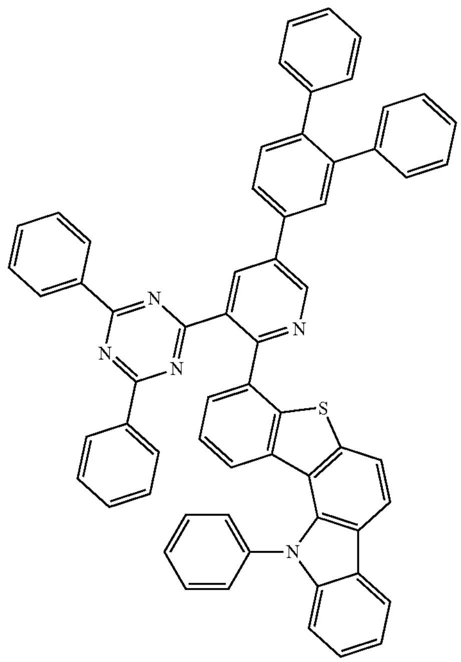
611
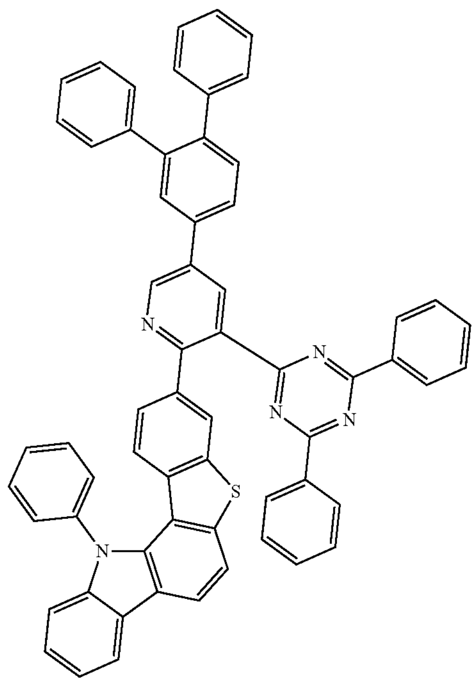
612
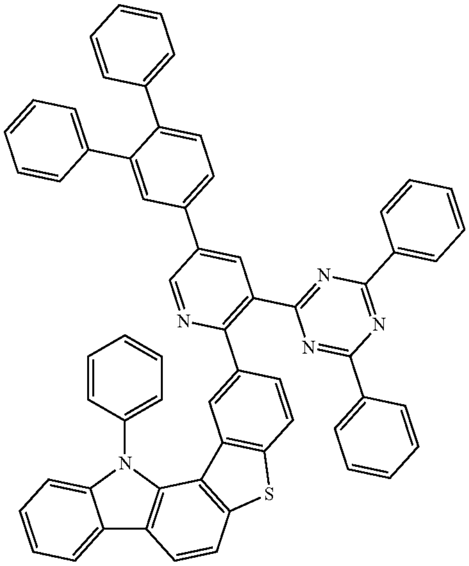
613
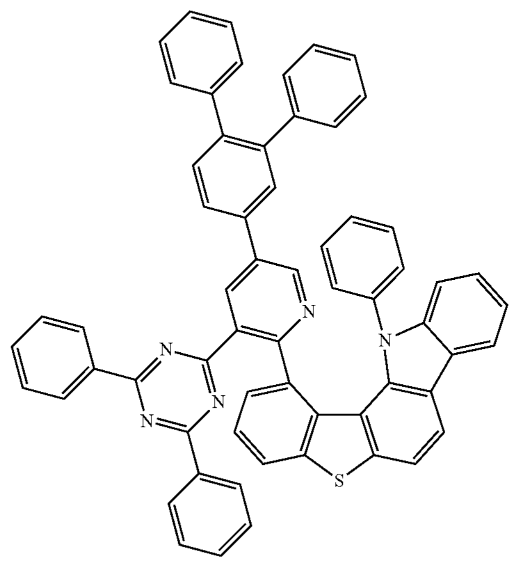

-continued
614
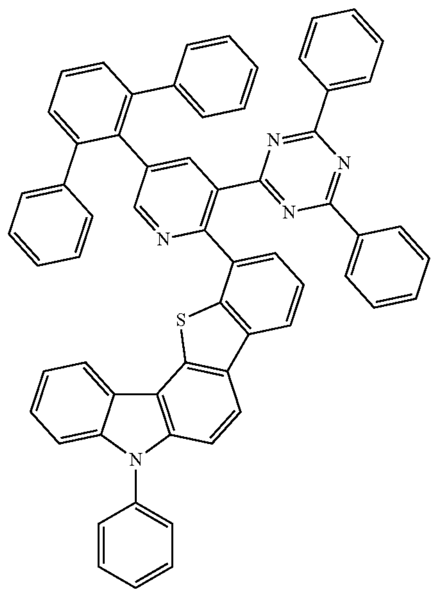
615
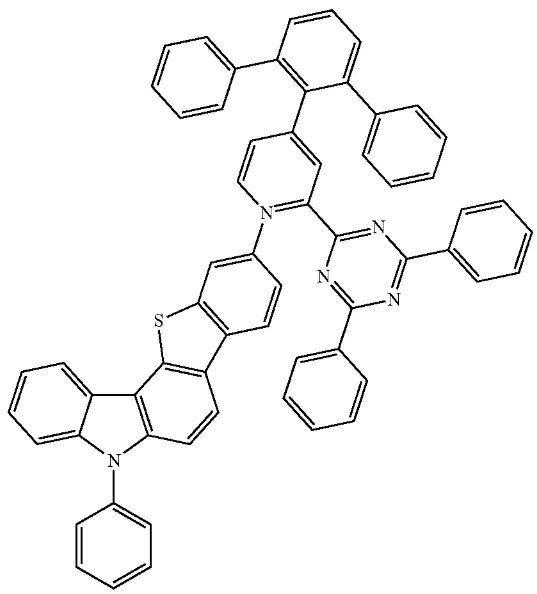
616
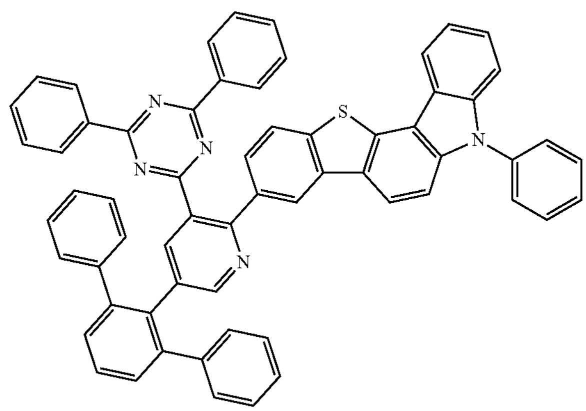
-continued
617
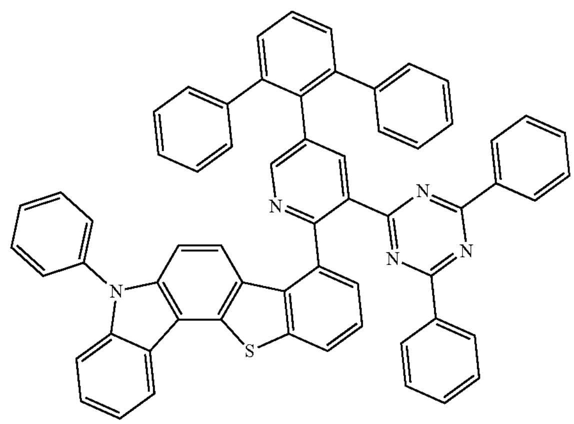
618
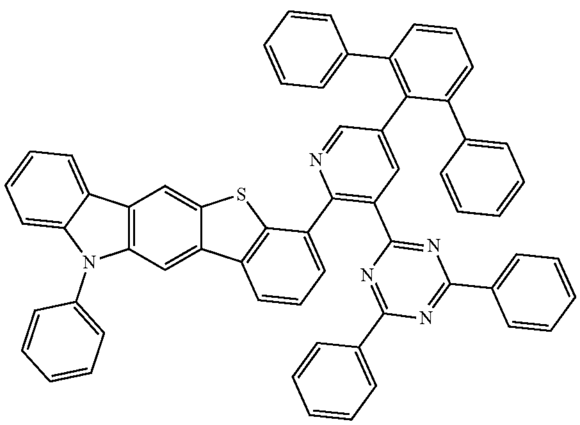
619
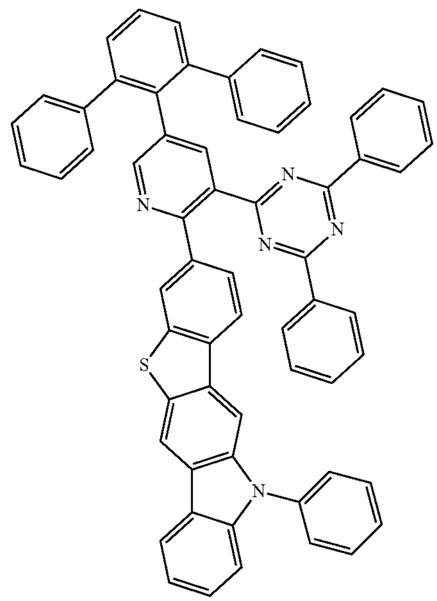

-continued
620
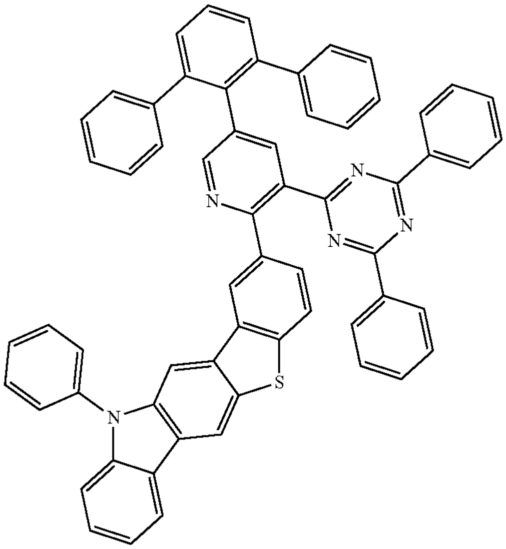
621
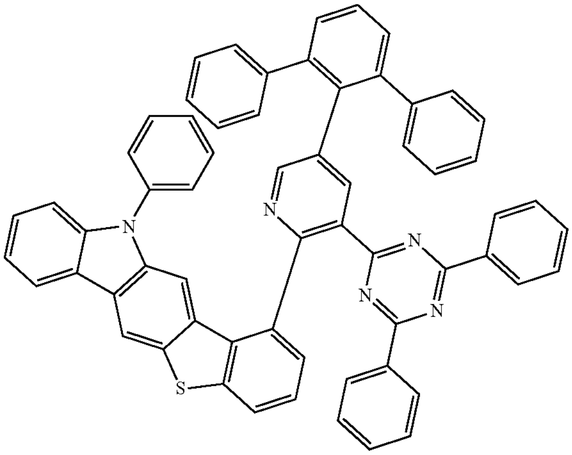
622
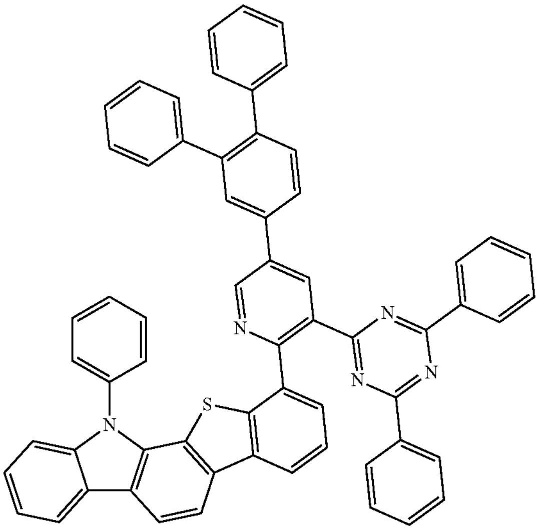
-continued
623
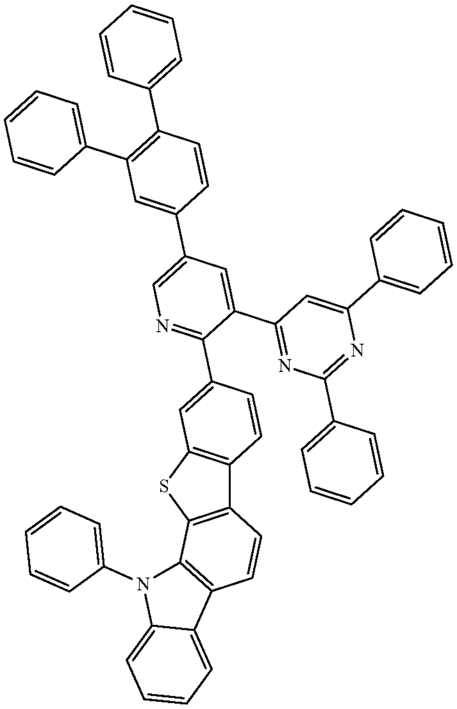
624
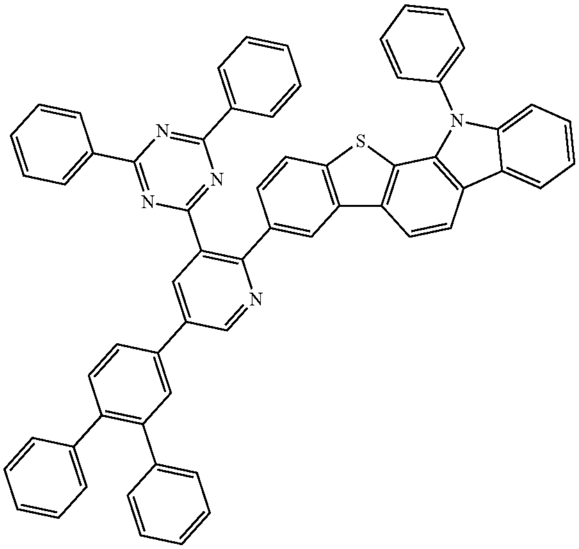

-continued
625
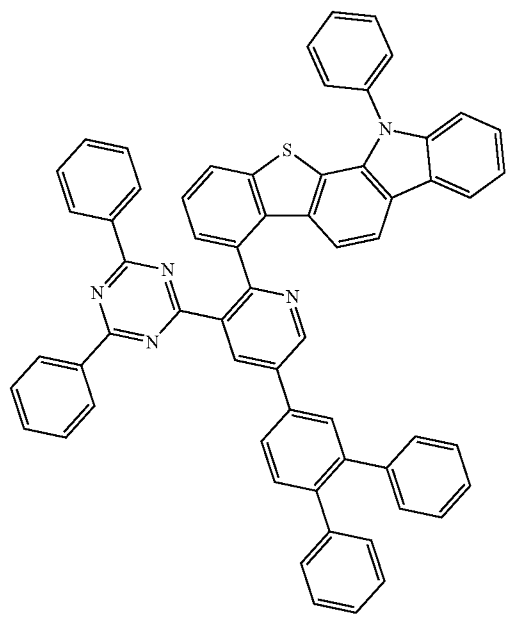
626
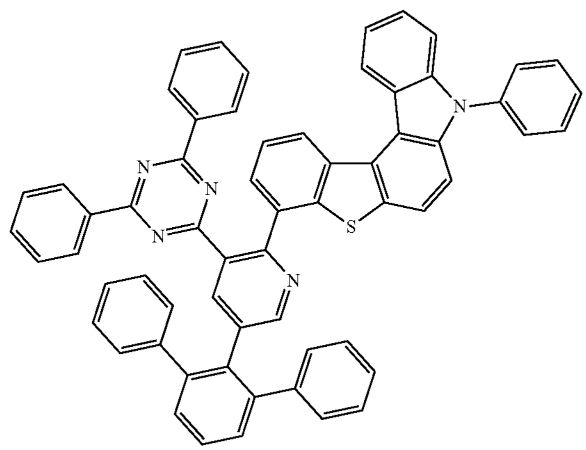
-continued
627
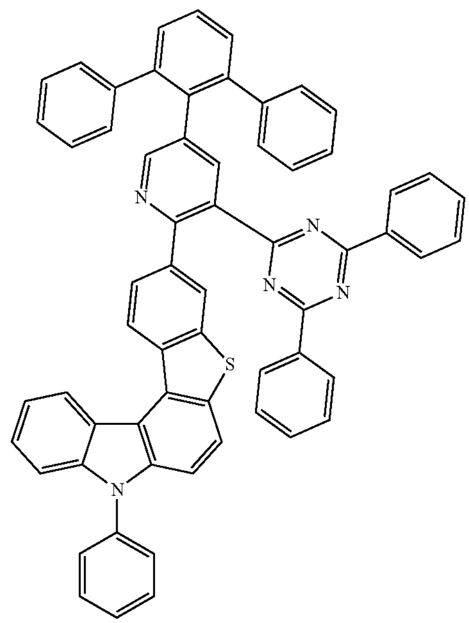
628
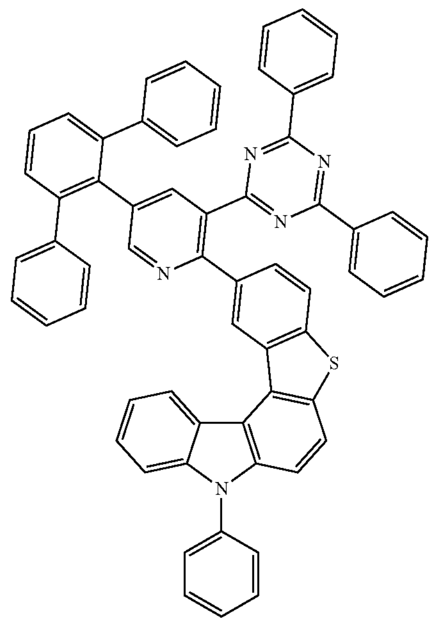

-continued
629
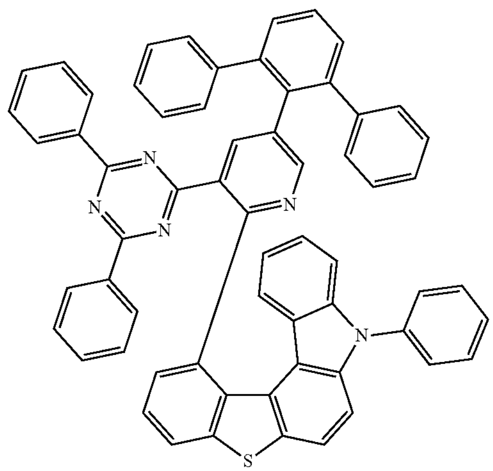
630
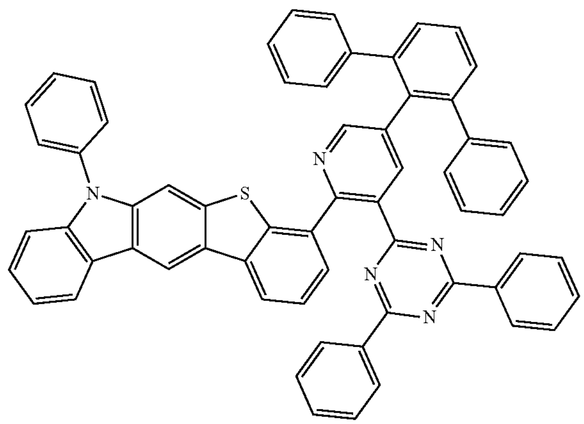
631
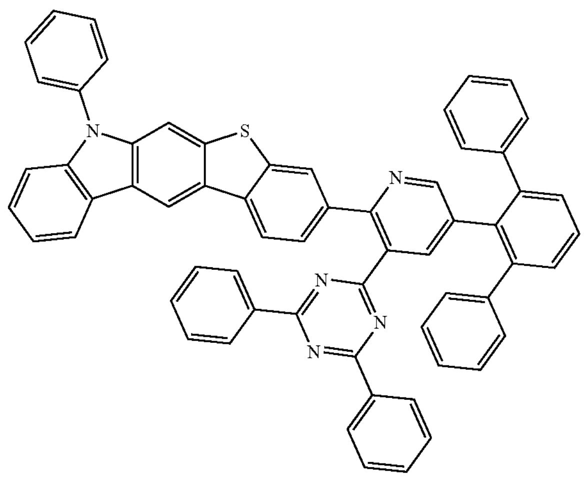
-continued
632
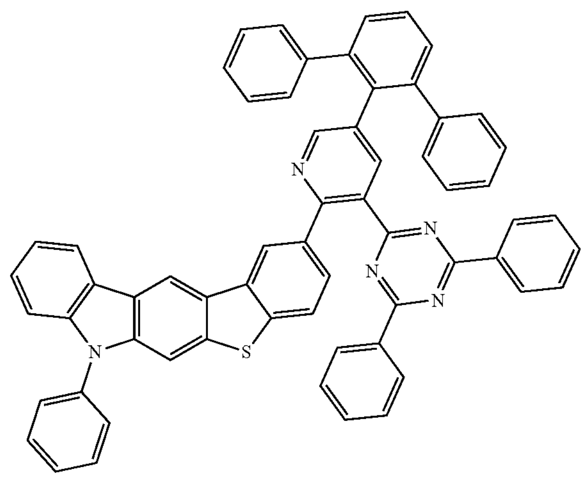
633
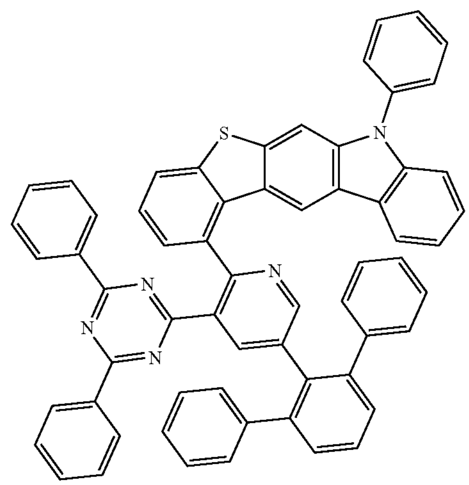
634
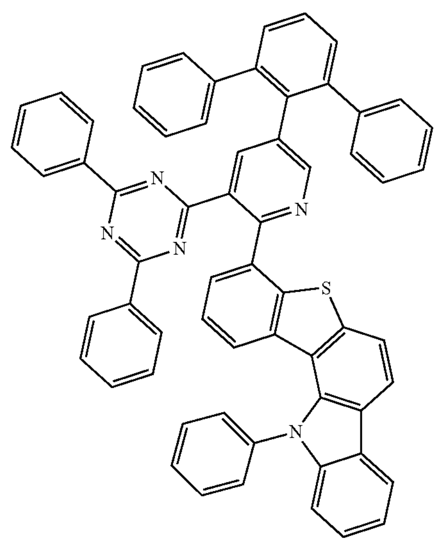

-continued
635
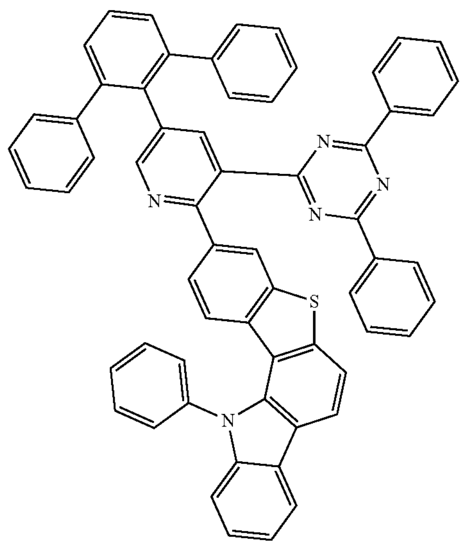
636
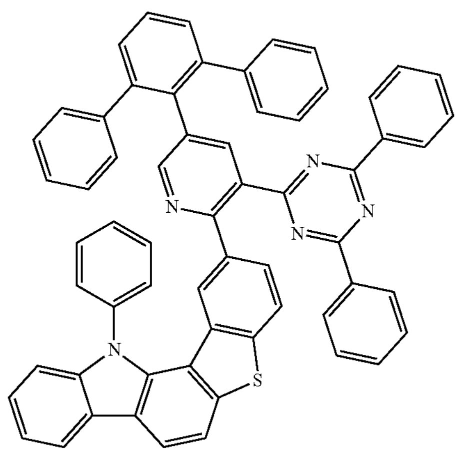
637
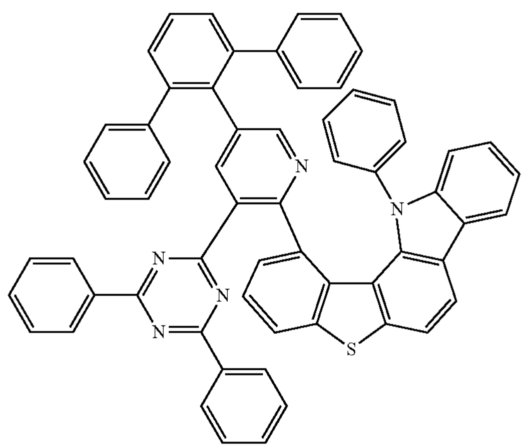
-continued
638
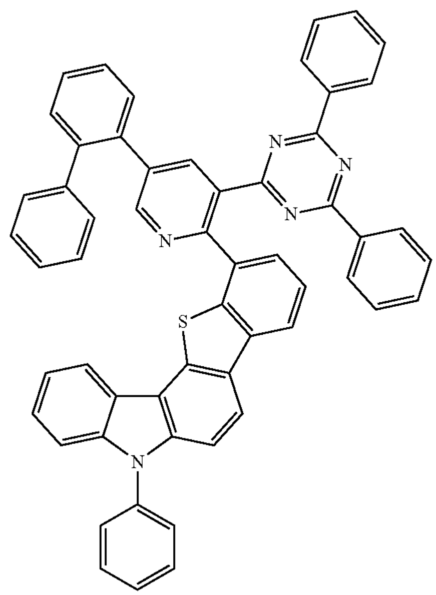
639
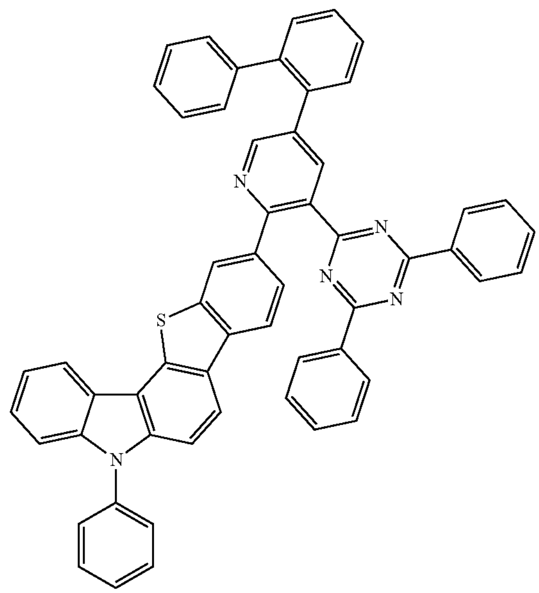
640
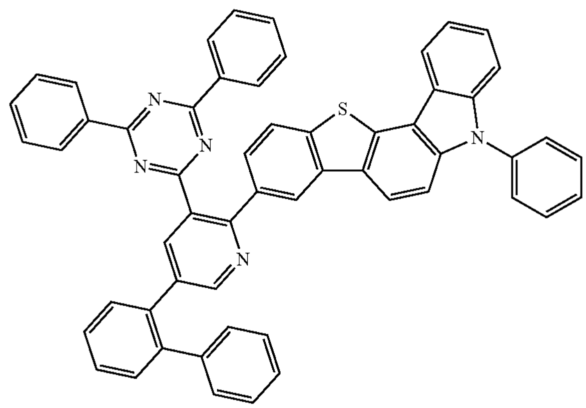

-continued
641
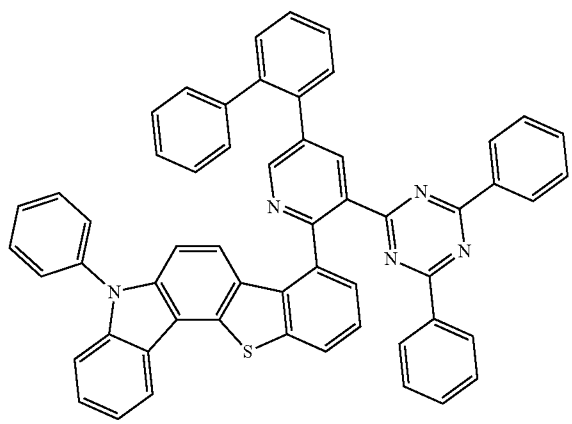
642
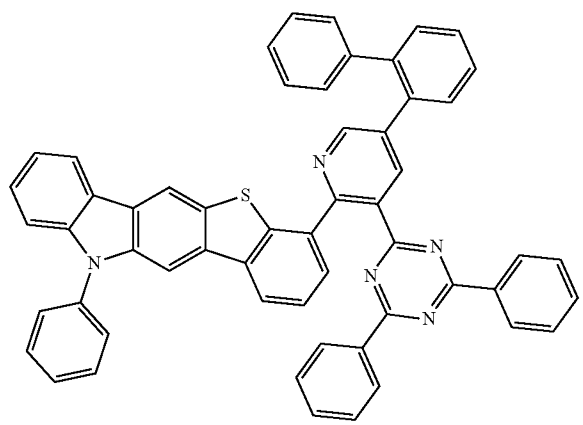
643
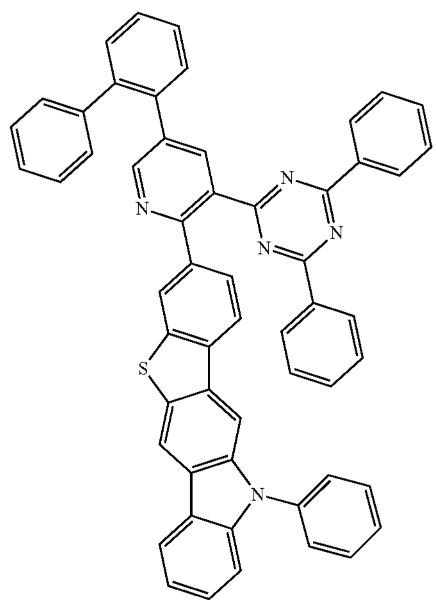
-continued
644
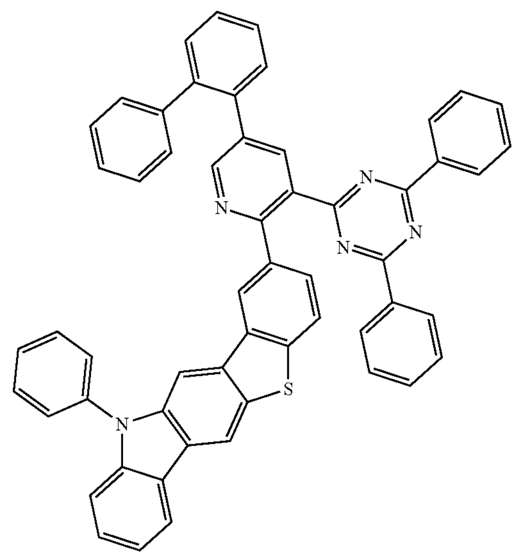
645
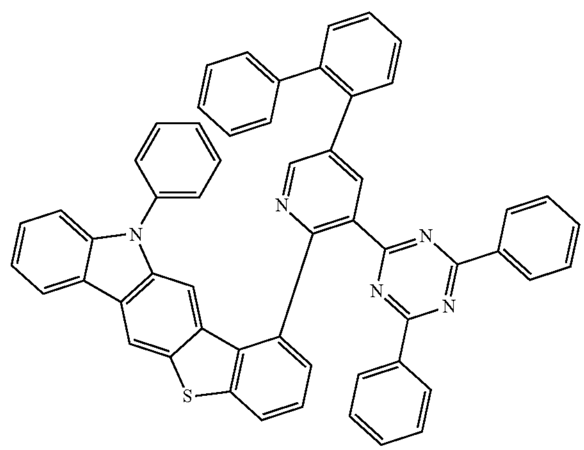
646
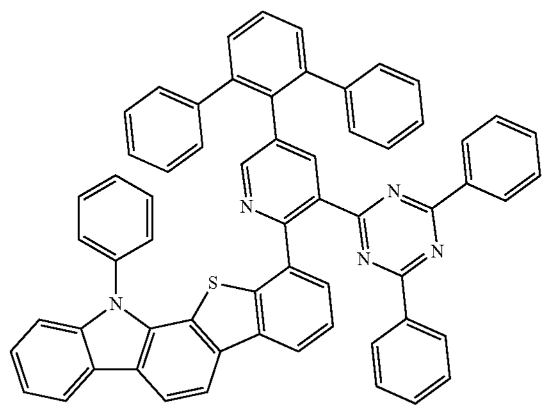

-continued
647
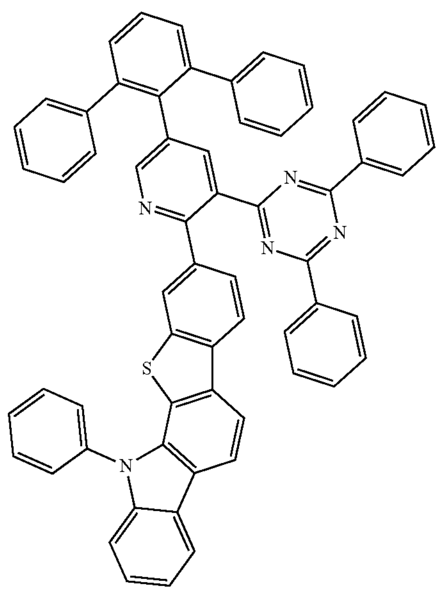
648
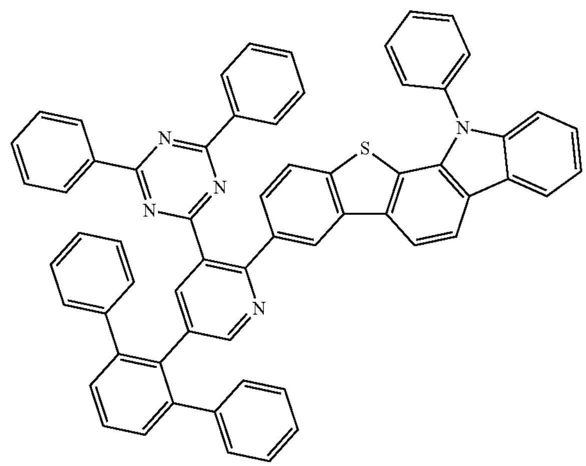
649
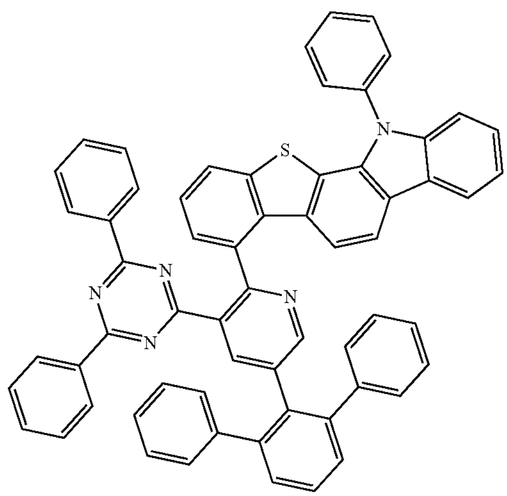
-continued
650
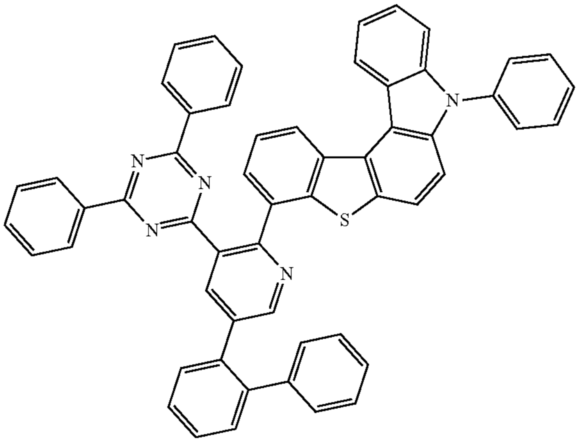
651
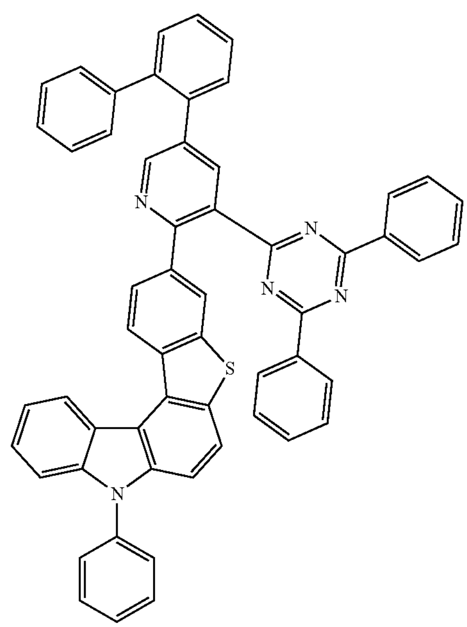

-continued
652
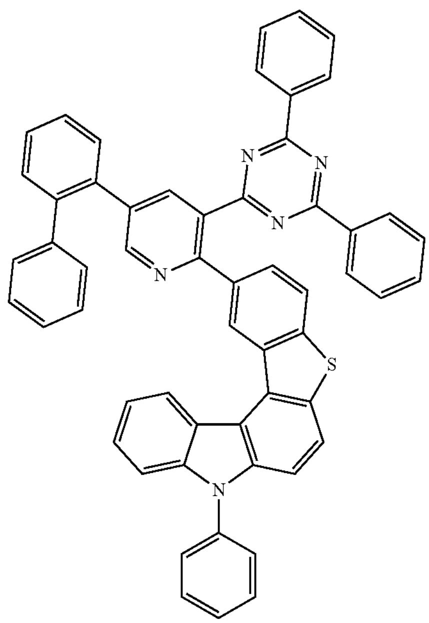
653
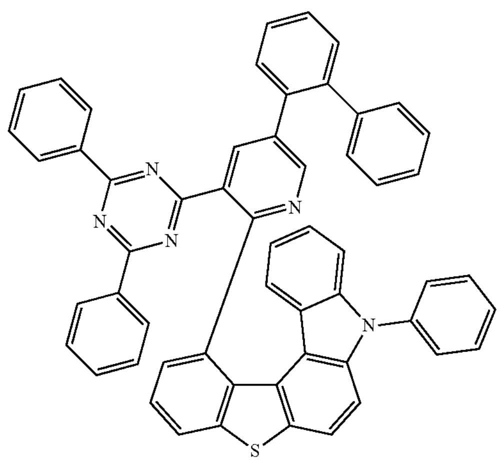
654
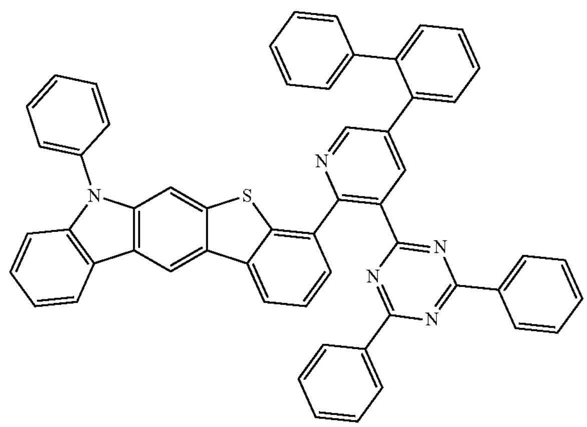
-continued
655
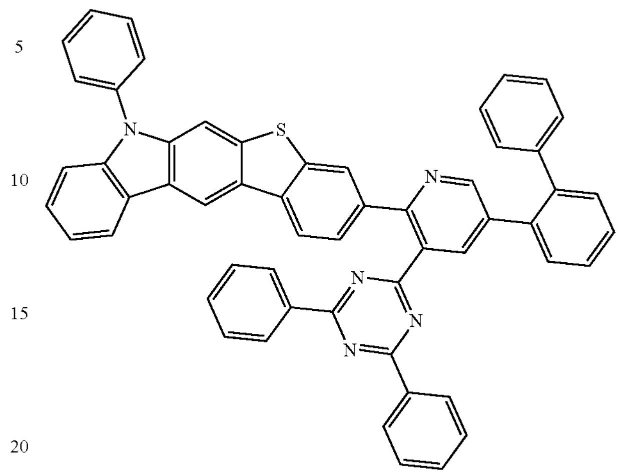
656
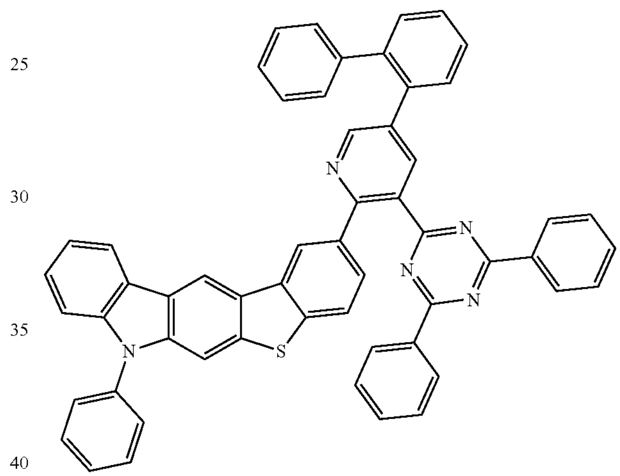
657
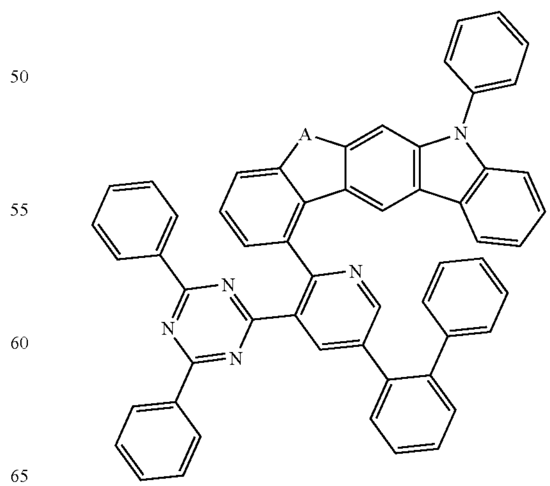

-continued
658
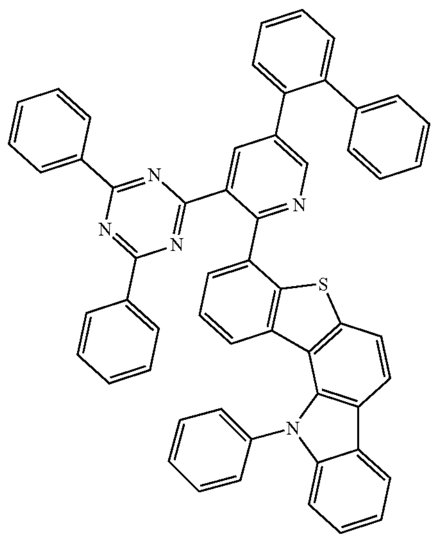
659
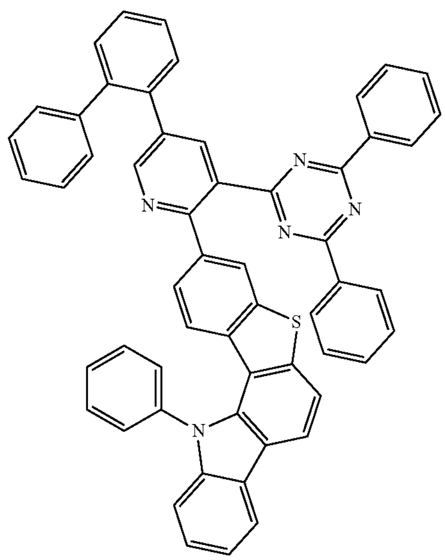
660
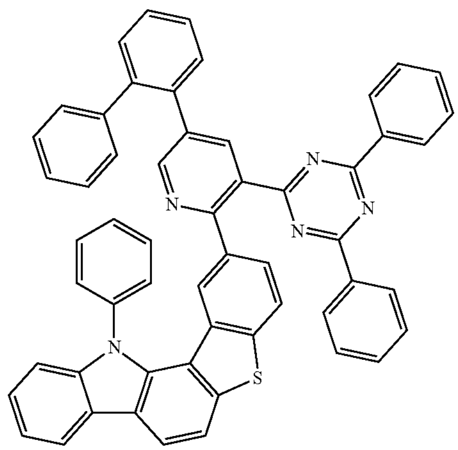
-continued
661
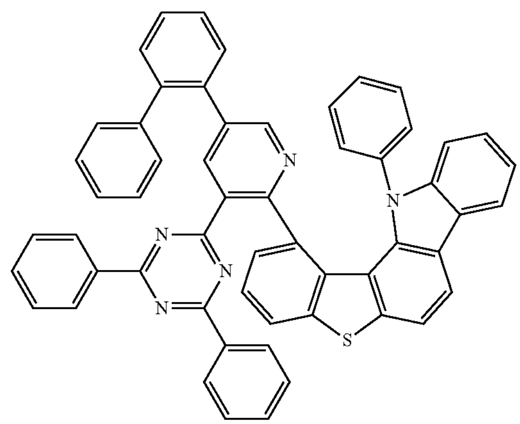
662
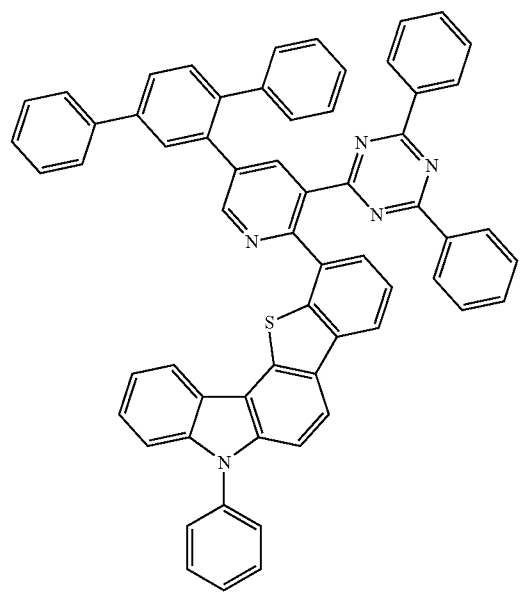

-continued
663
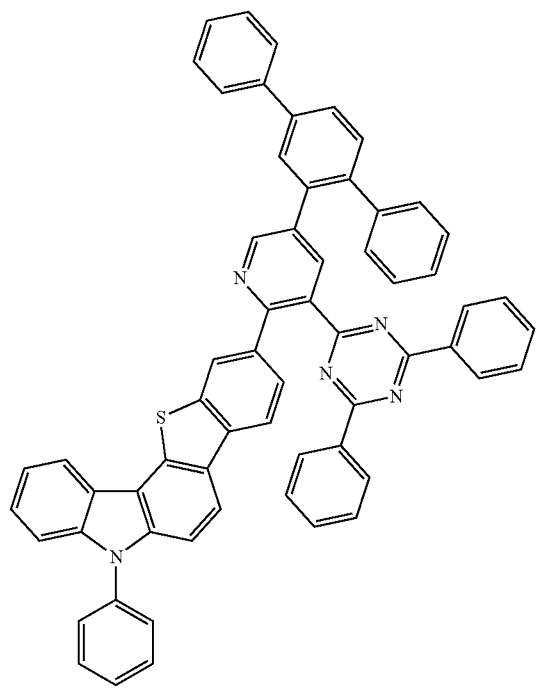
664
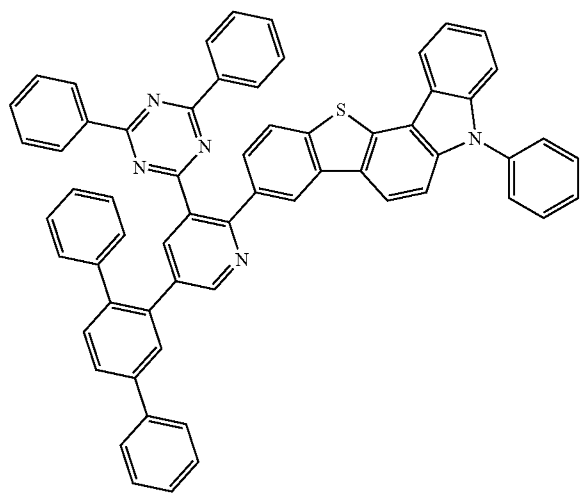
-continued
665
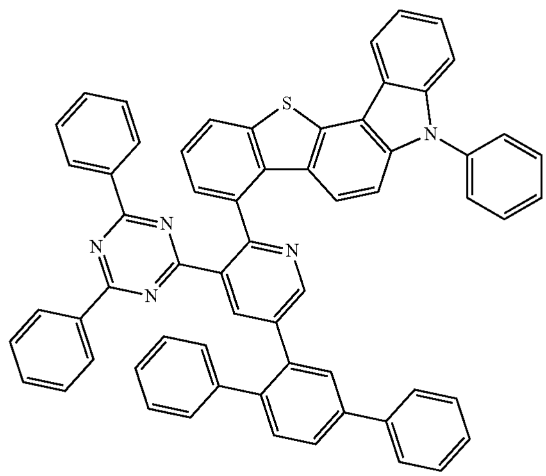
666
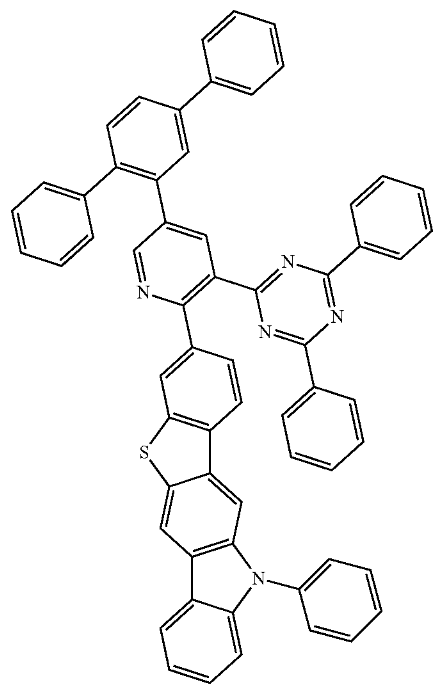
667

-continued
668
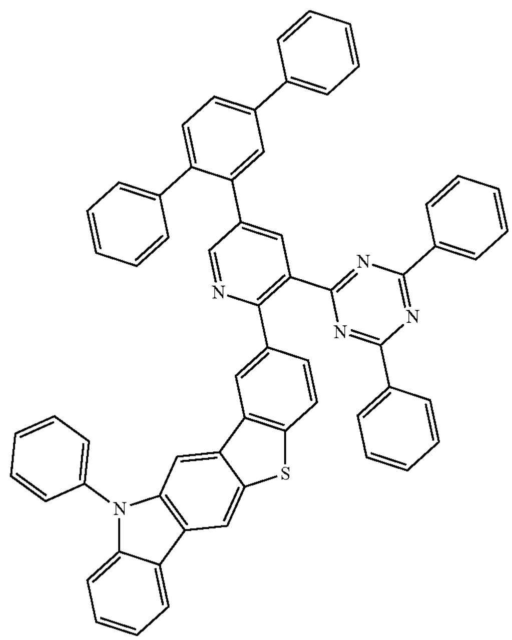
669
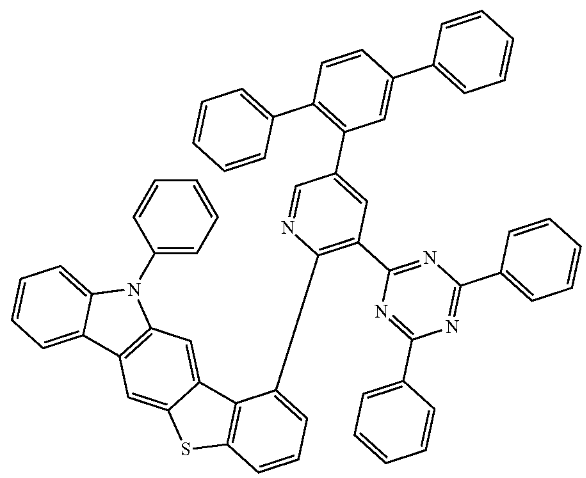
670
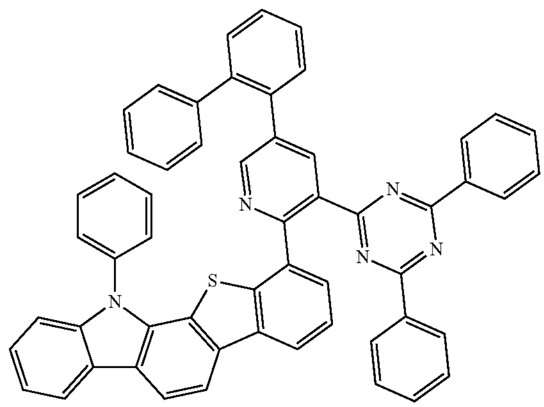
-continued
671
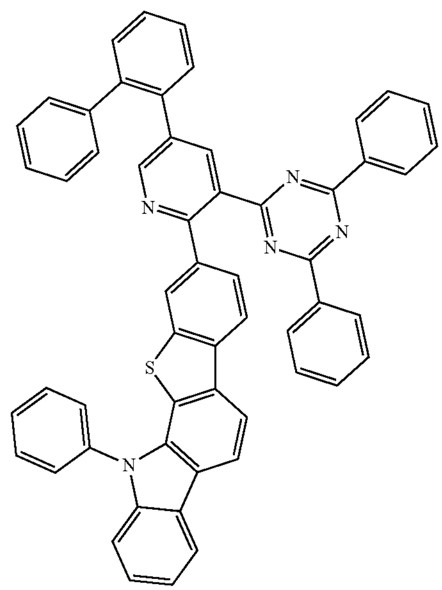
672
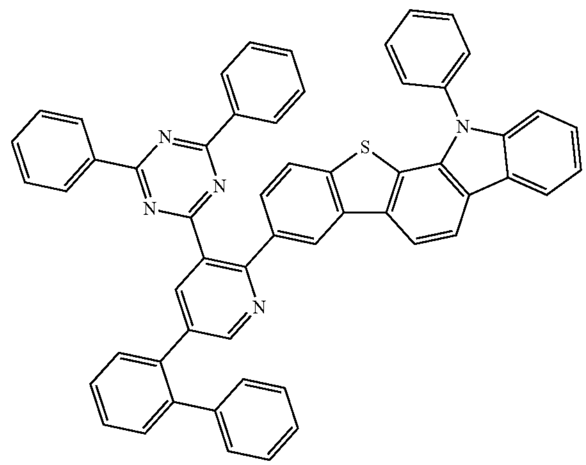
673
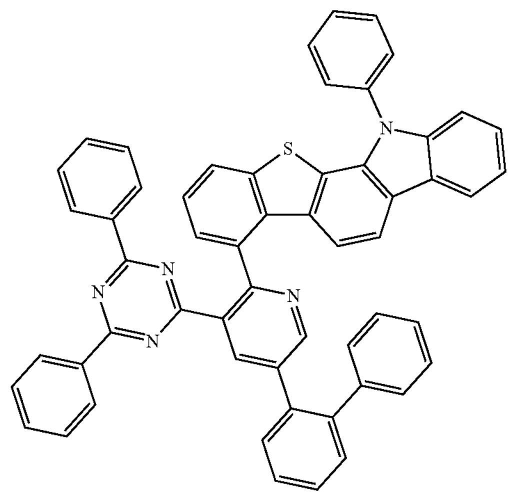

-continued
674
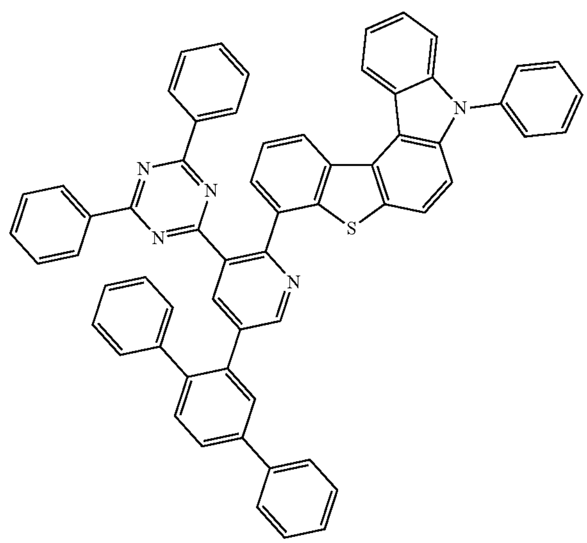
675
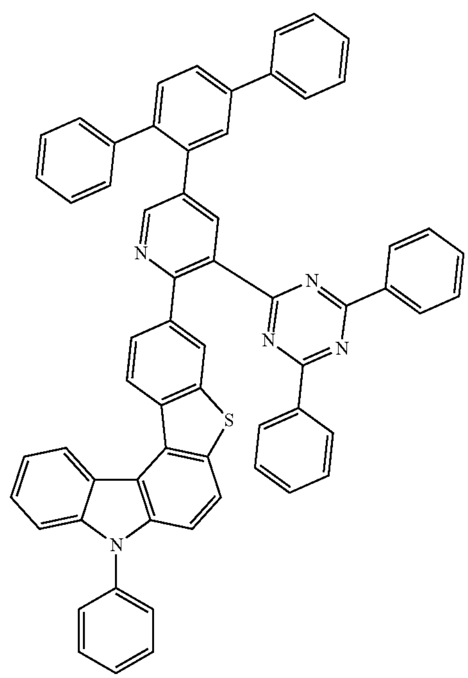
-continued
676
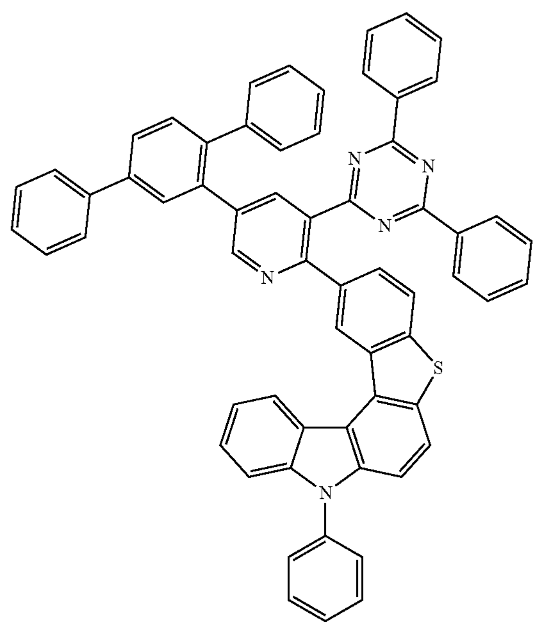
677
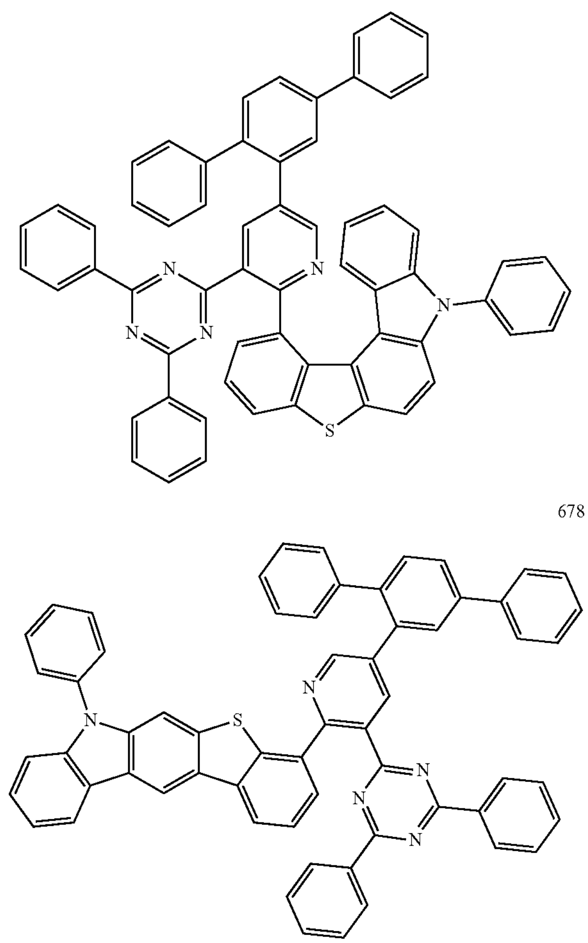
678

-continued
679
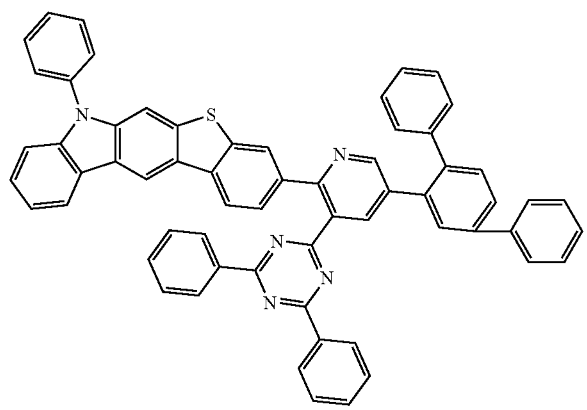
680
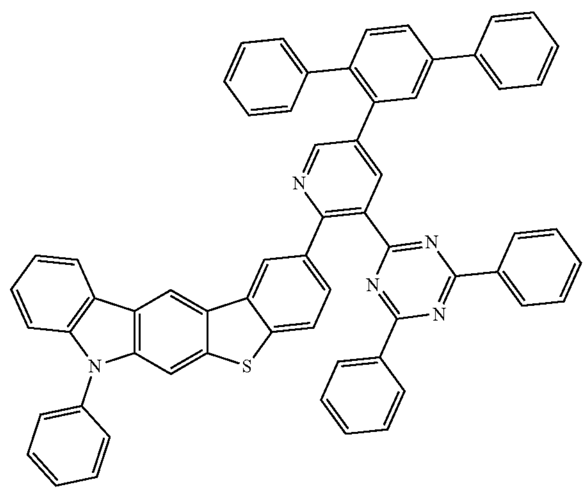
681
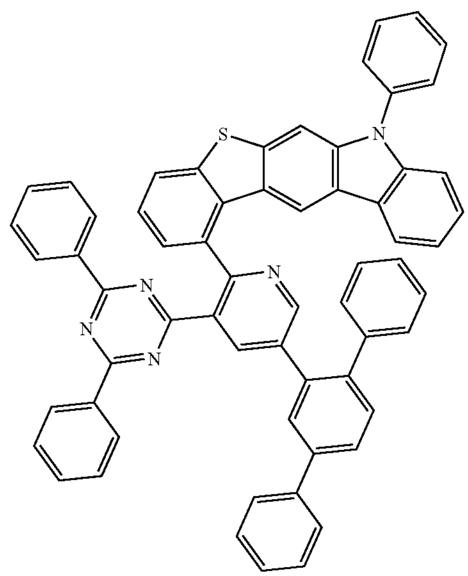
-continued
682
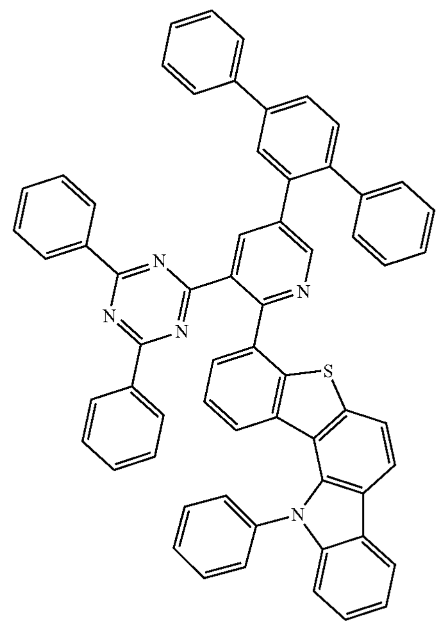
683
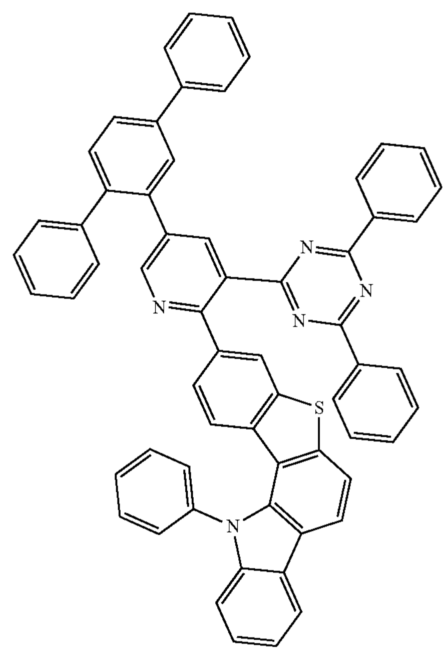

-continued
684
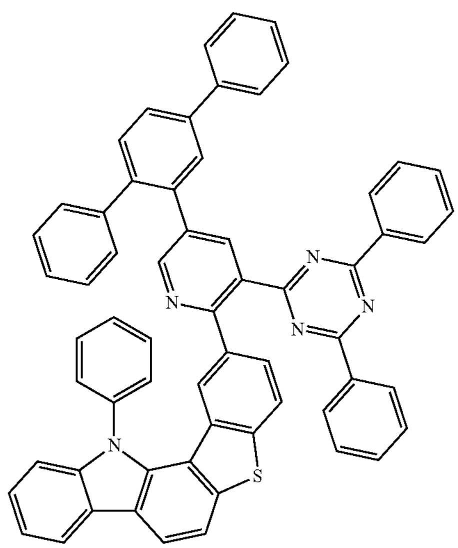
685
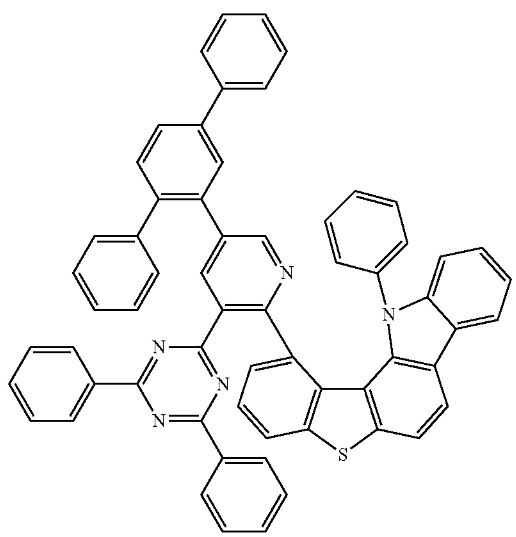
686
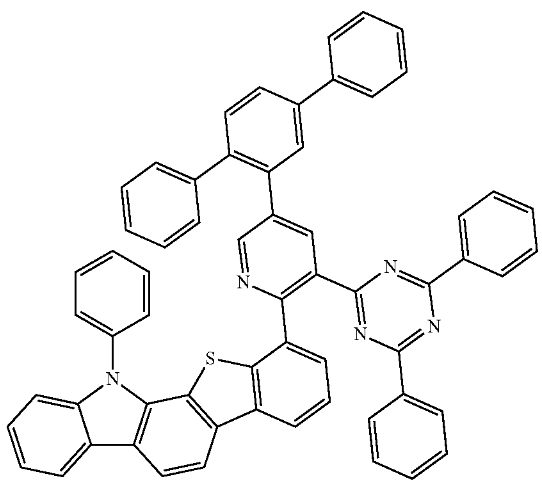
-continued
687
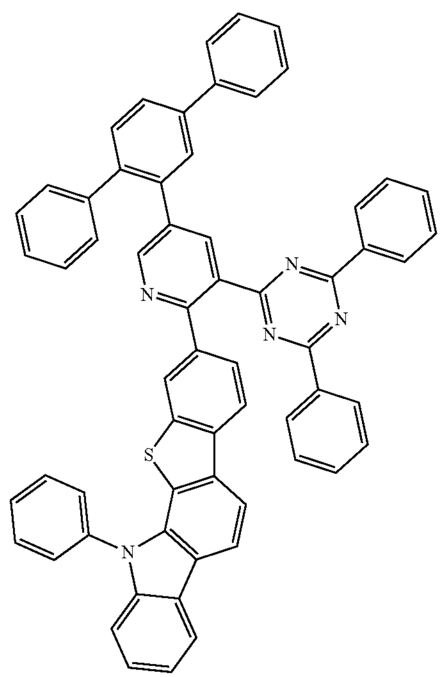
688
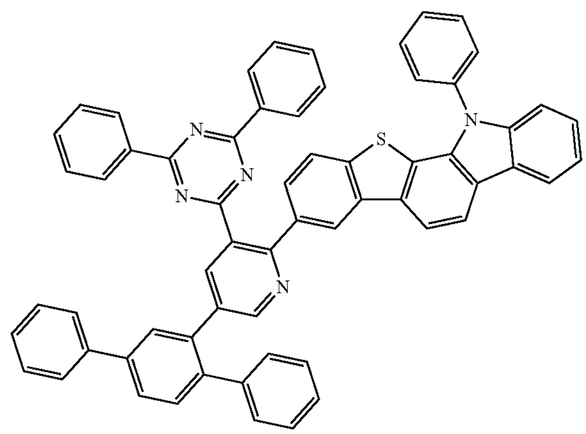

-continued
689
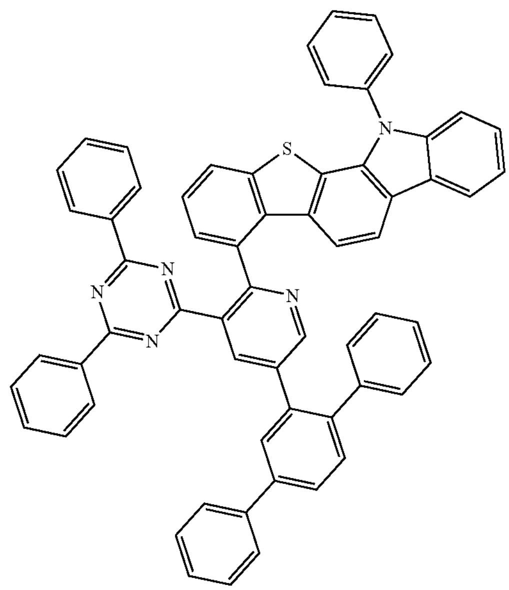
690
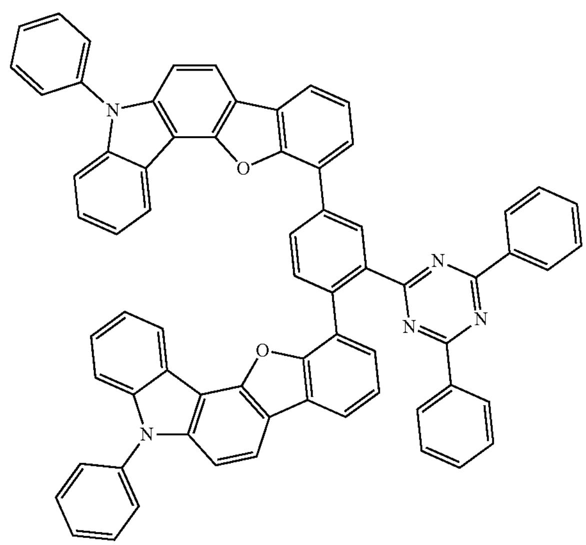
-continued
691
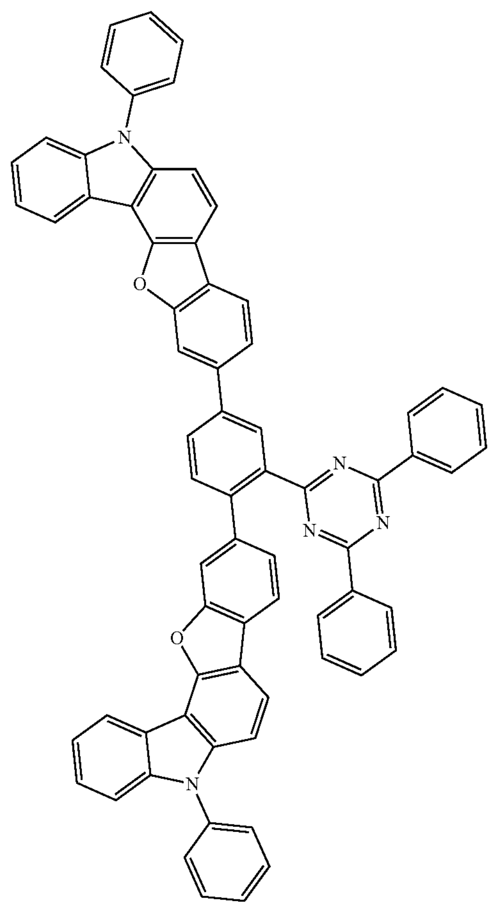

-continued
692
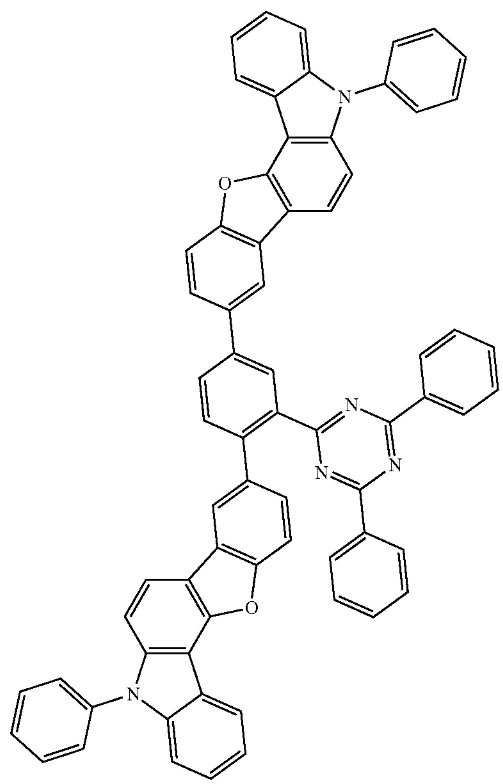
693
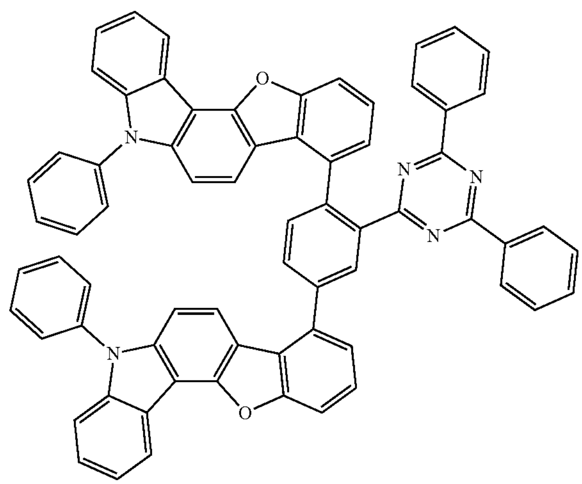
-continued
694
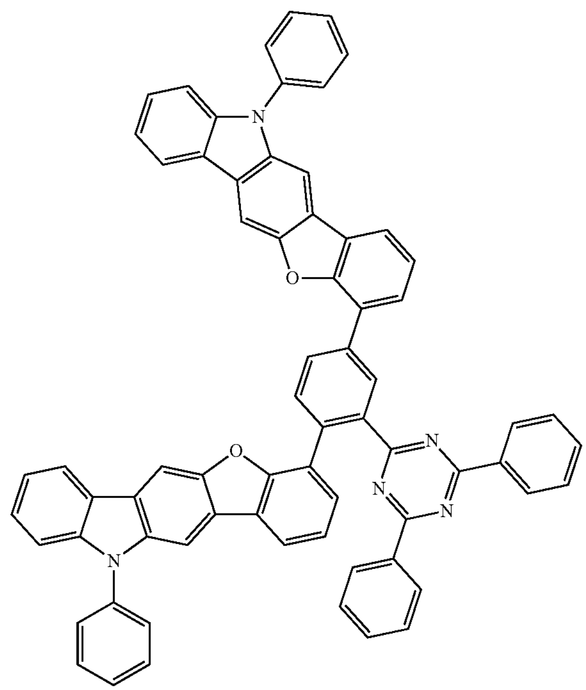
695
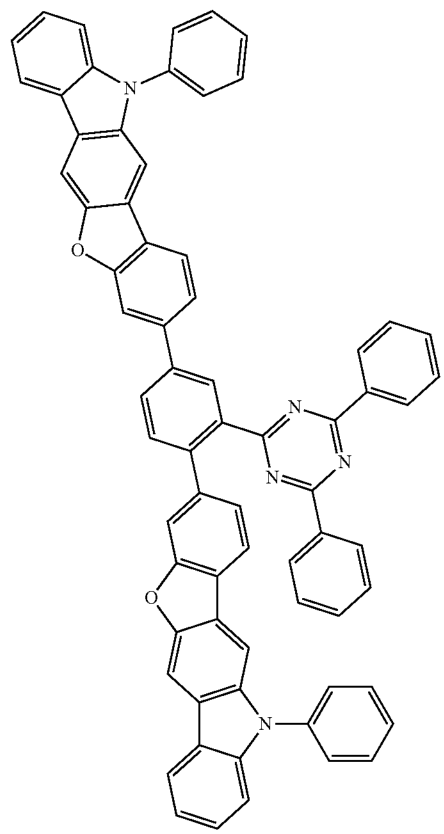

-continued
696
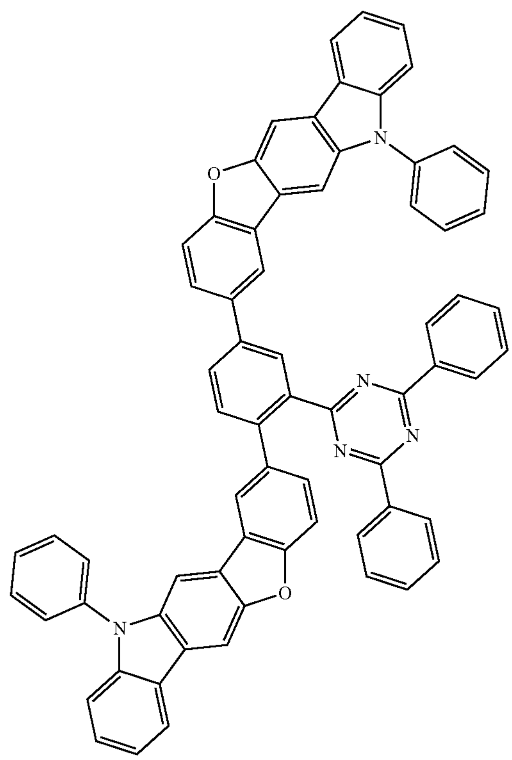
697
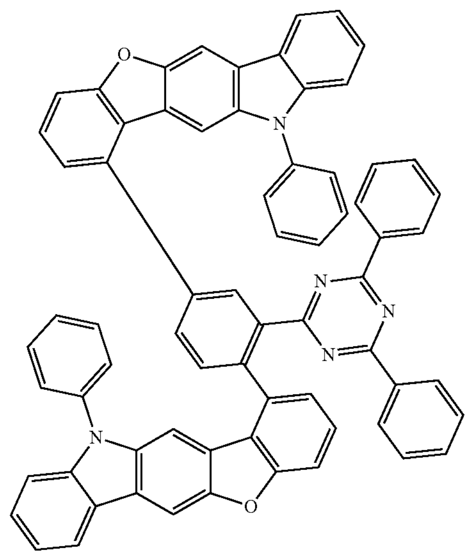
-continued
698
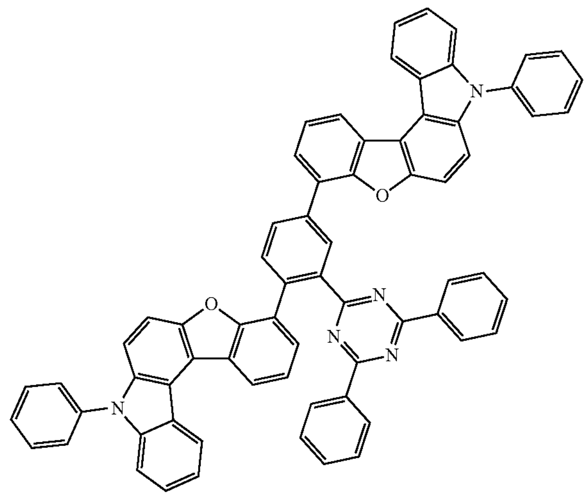
699
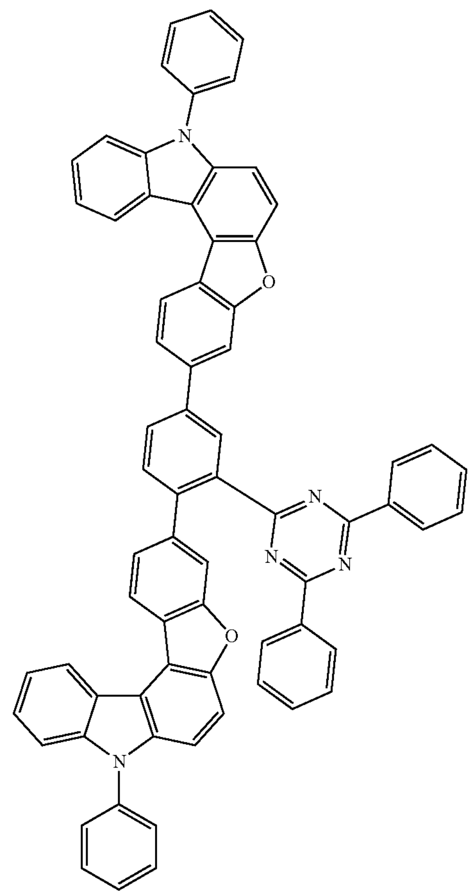

-continued
700
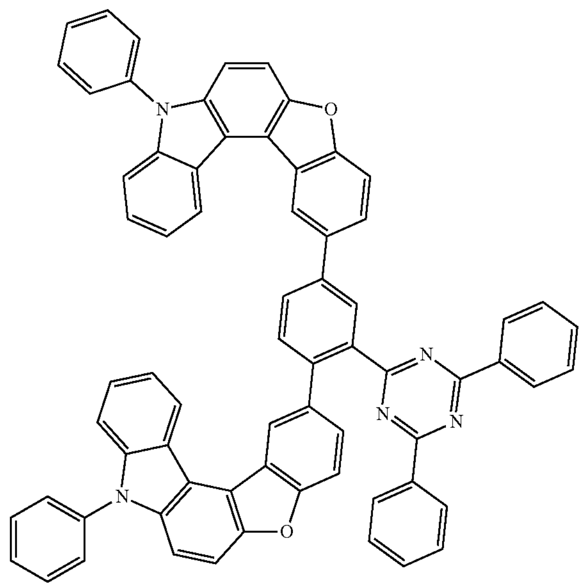
701
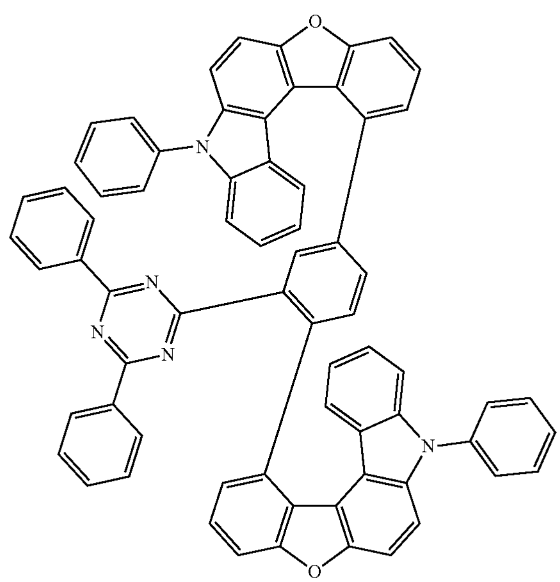
-continued
702
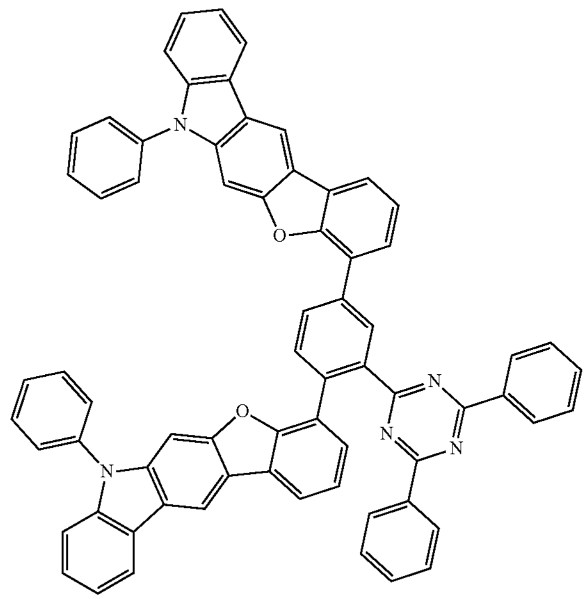
703
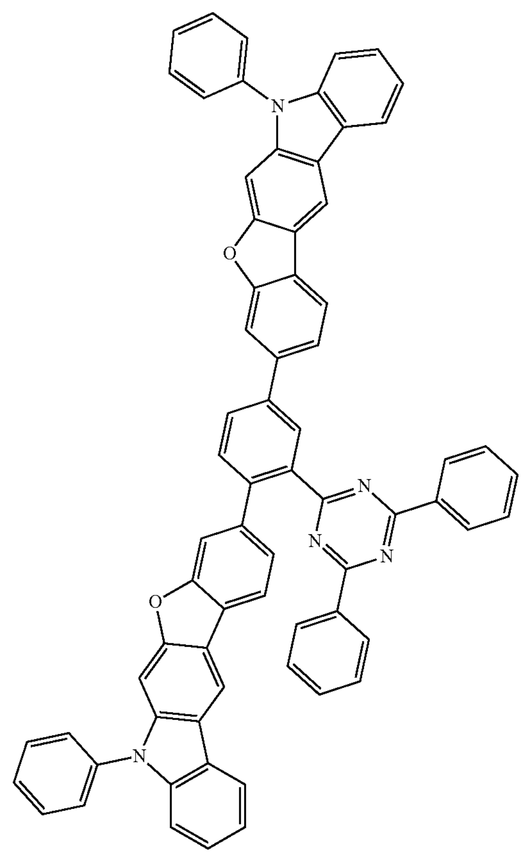

-continued
704
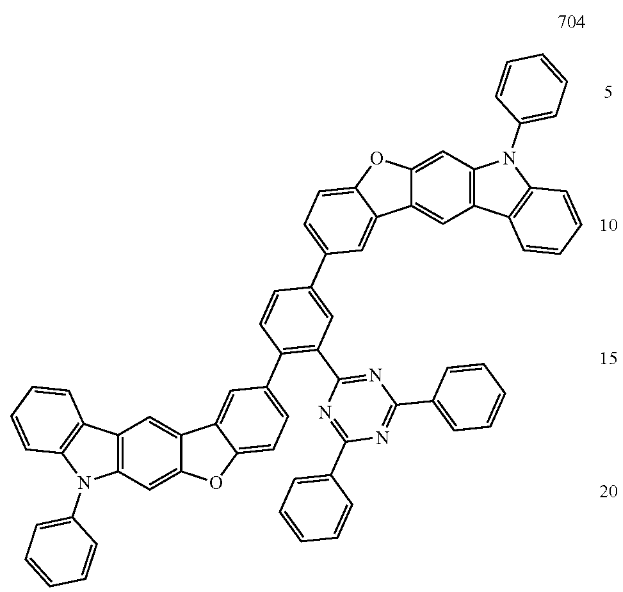
705
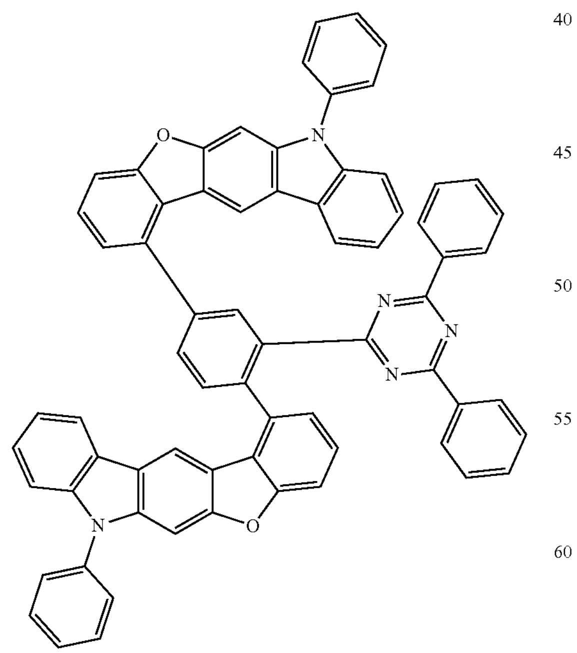
-continued
706
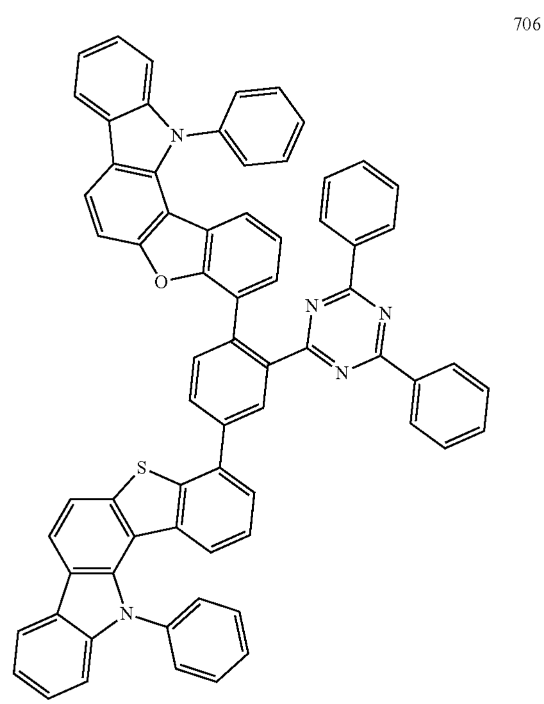
707
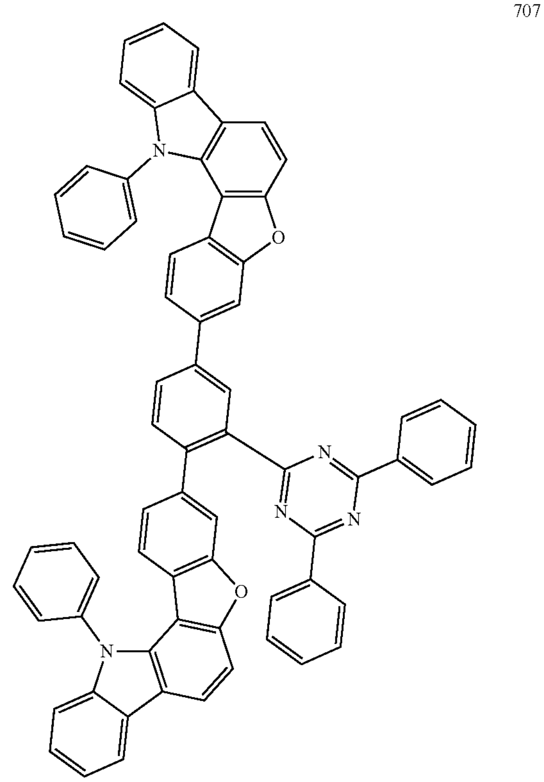

-continued
708
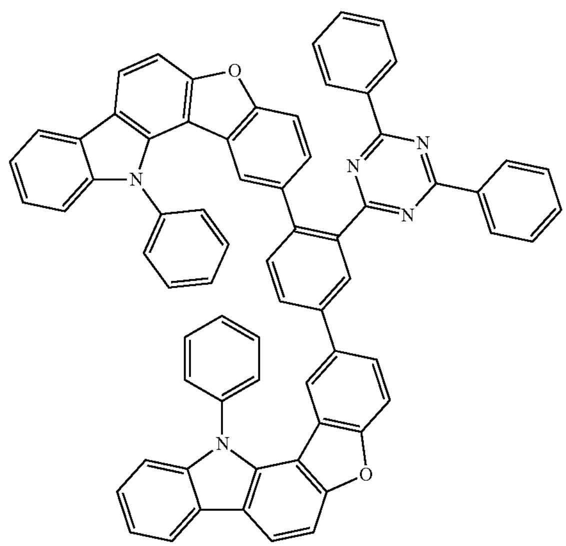
709
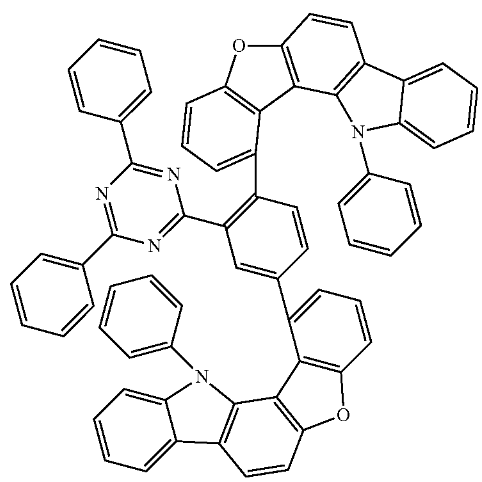
710
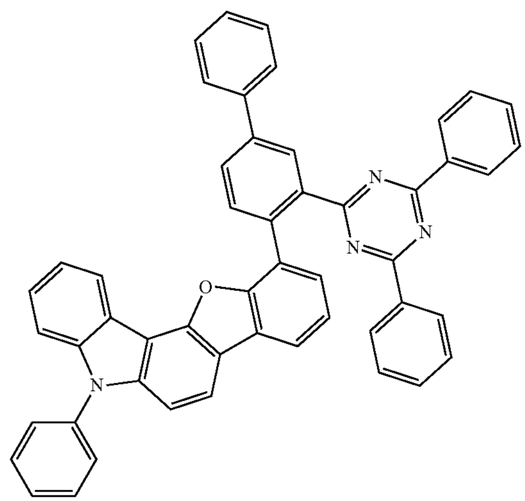
711
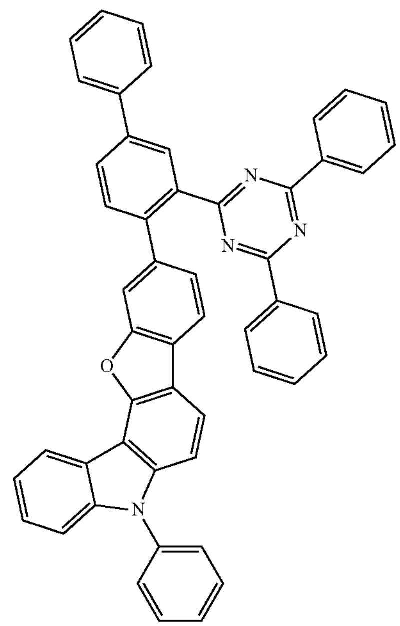
712
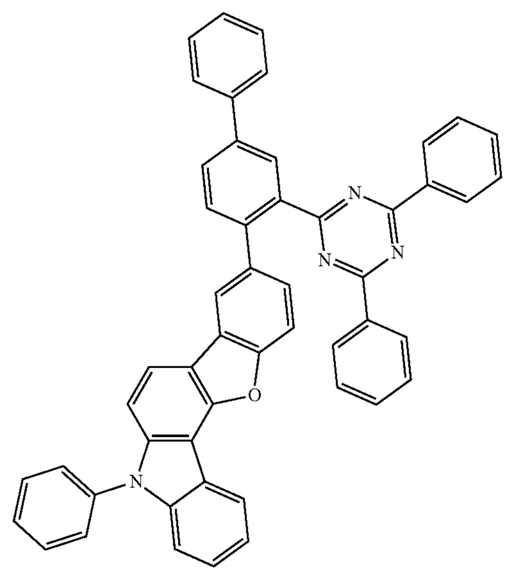
713
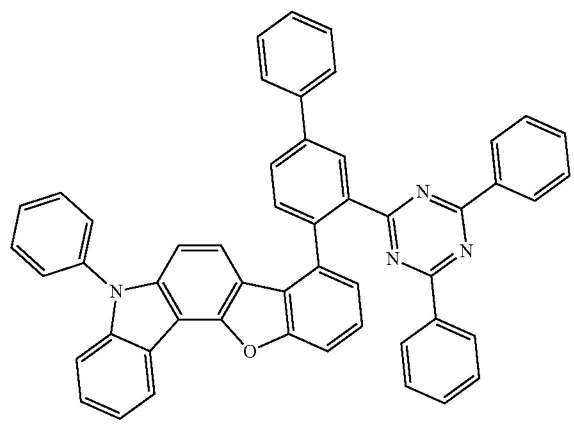

-continued
714
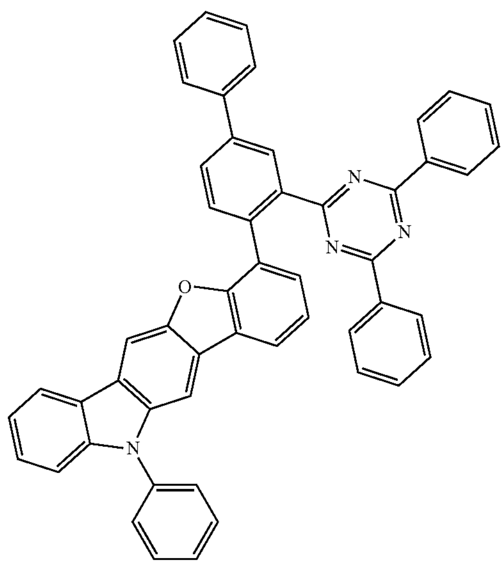
715
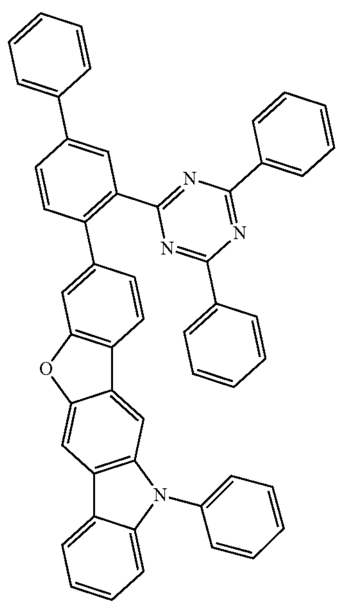
-continued
716
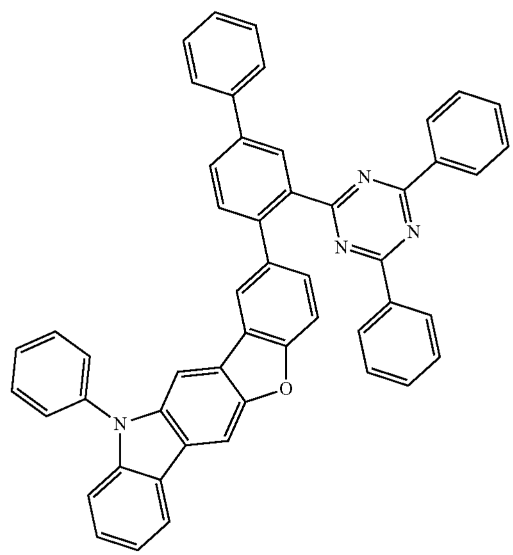
717
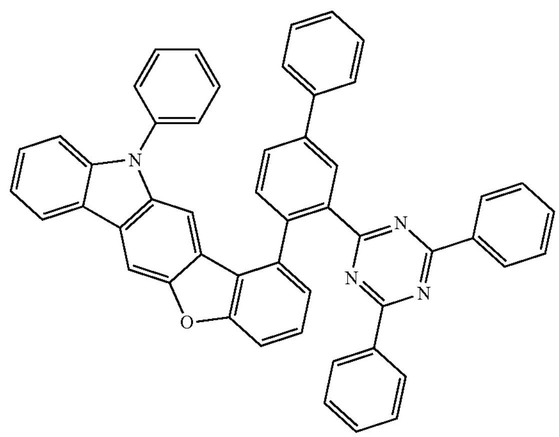
718
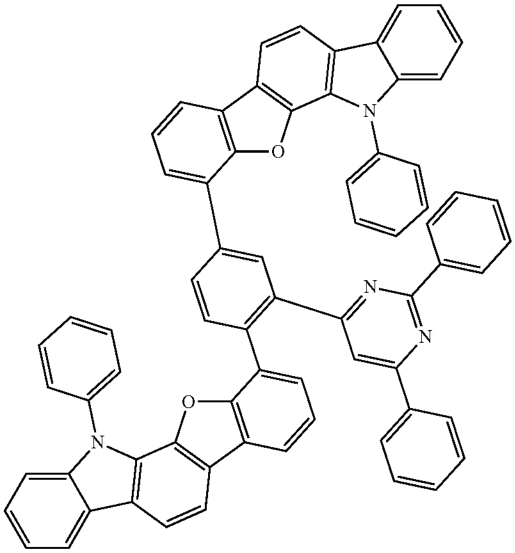

-continued
719
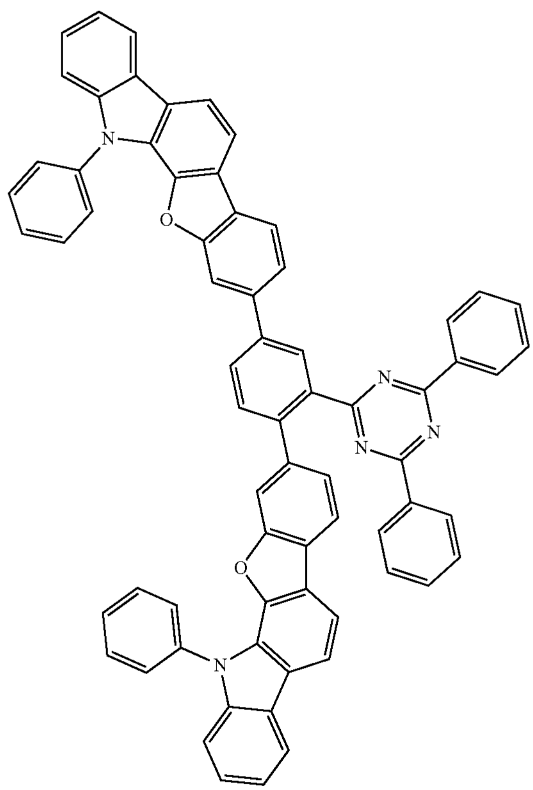
720
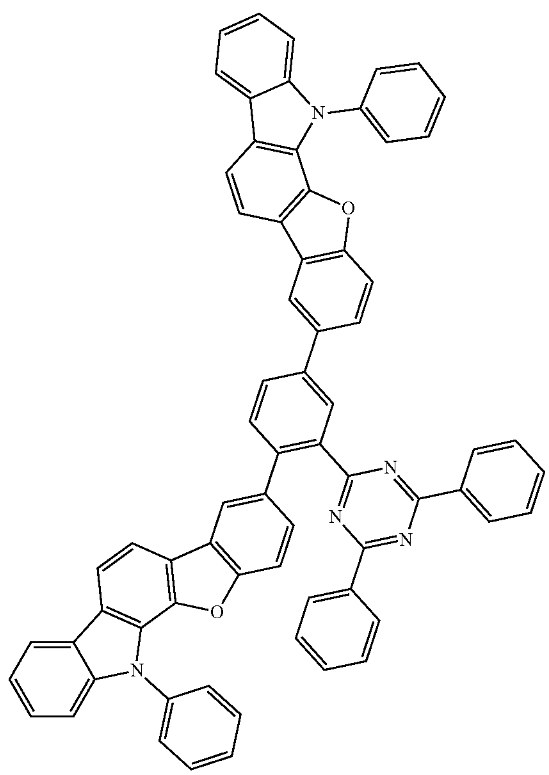
-continued
721
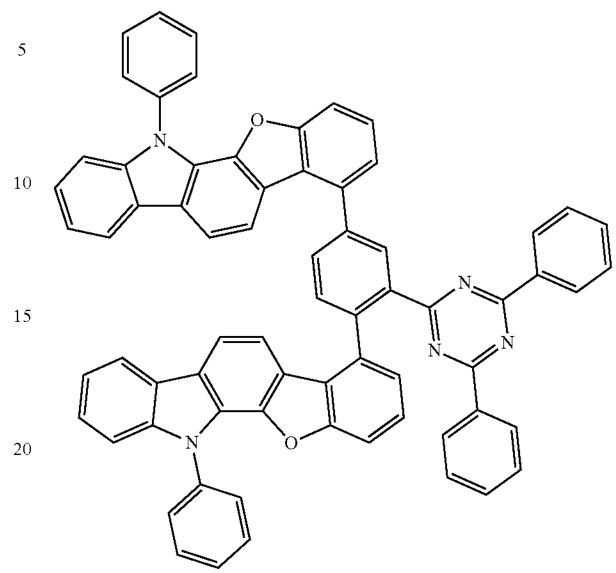
722
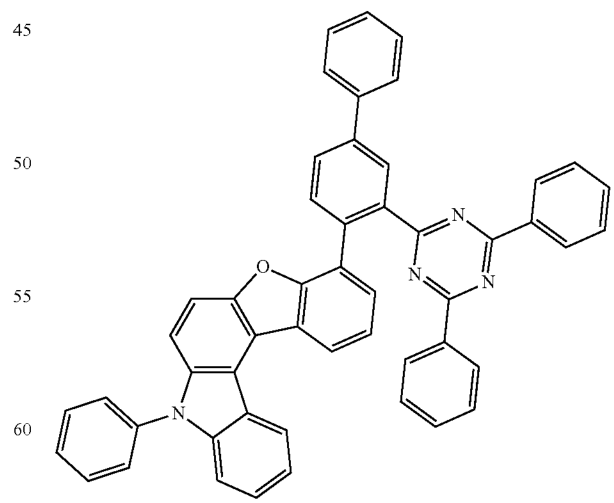

-continued
723
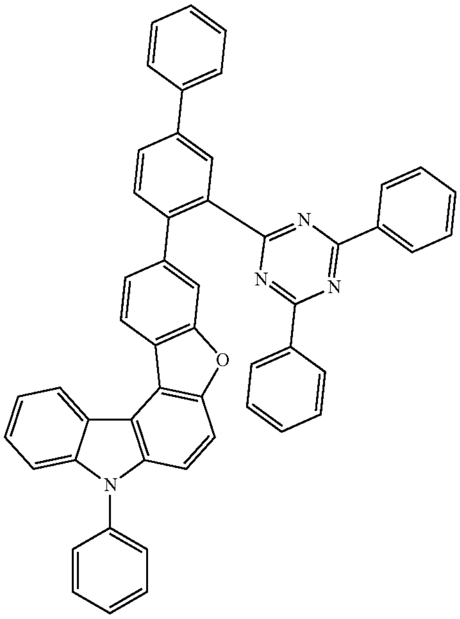
724
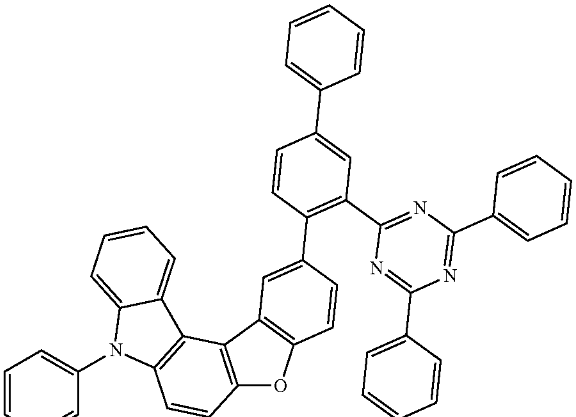
725
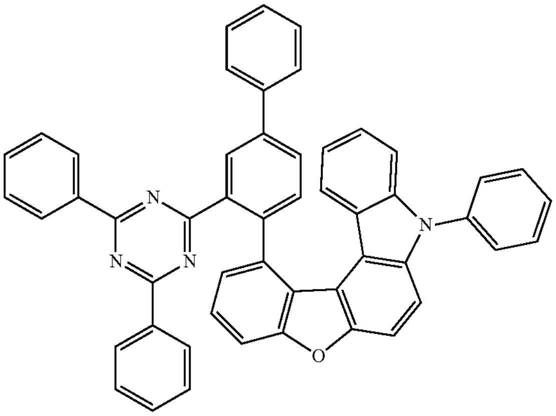
-continued
726
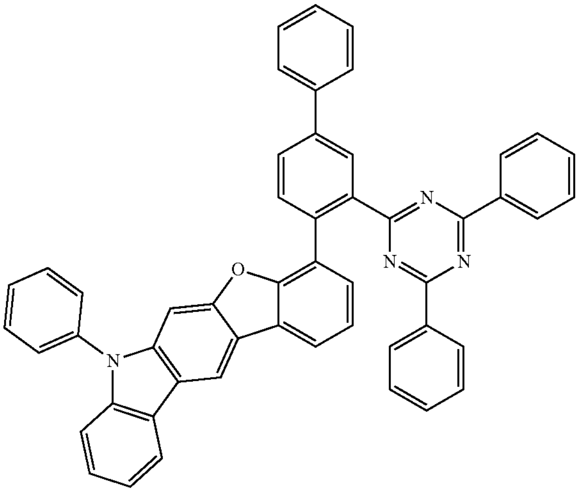
727
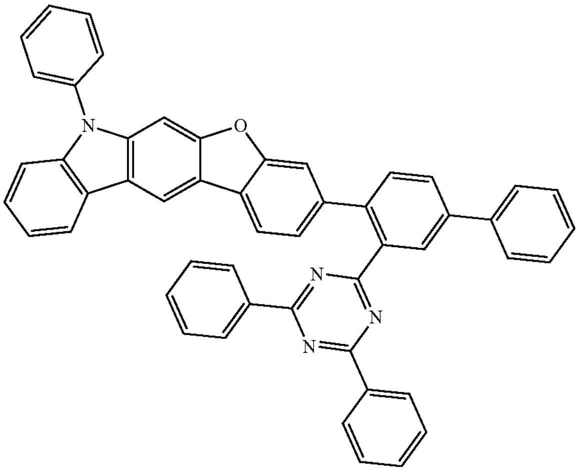
728
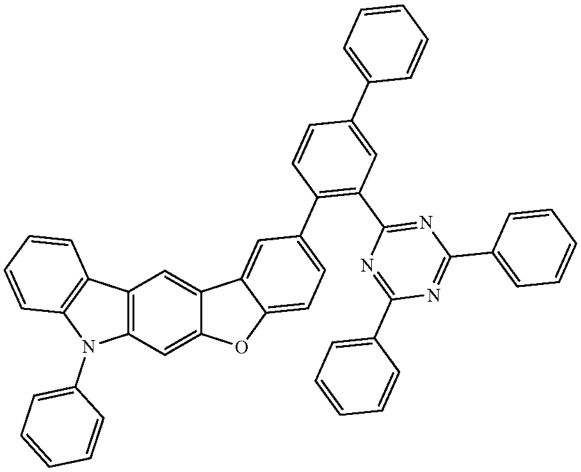

-continued
729
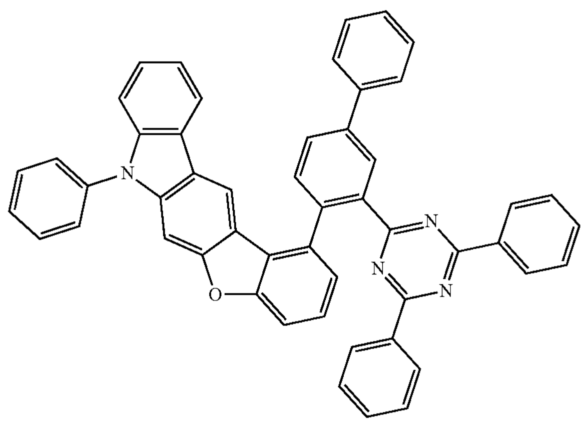
730
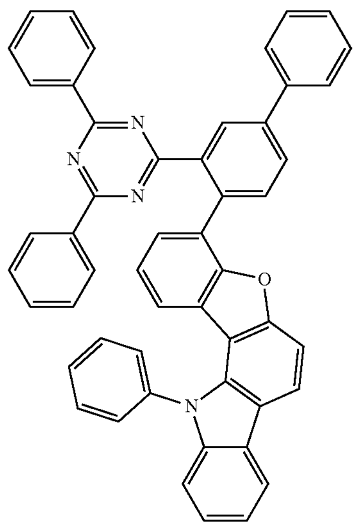
731
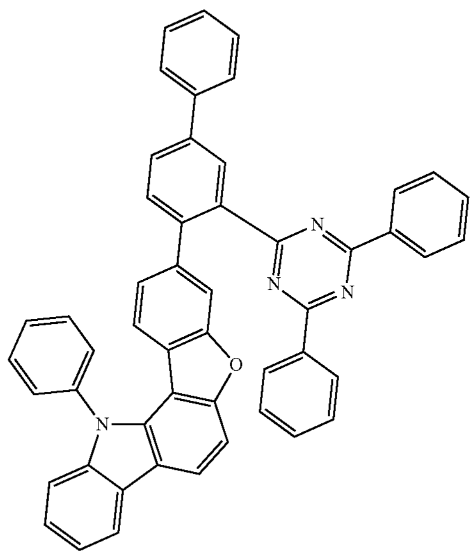
-continued
732
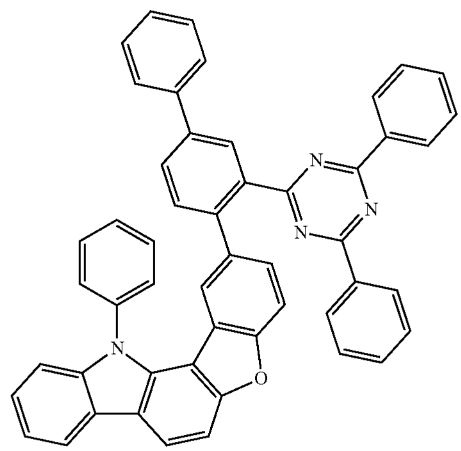
733
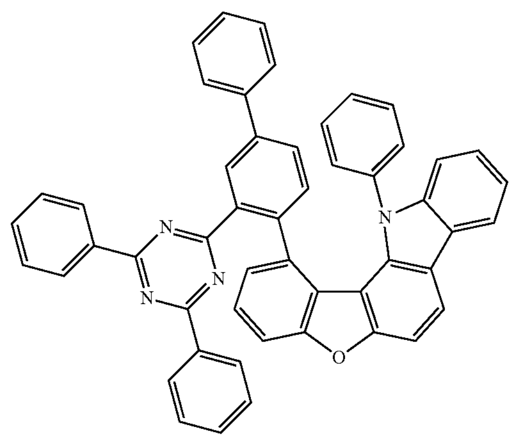
734
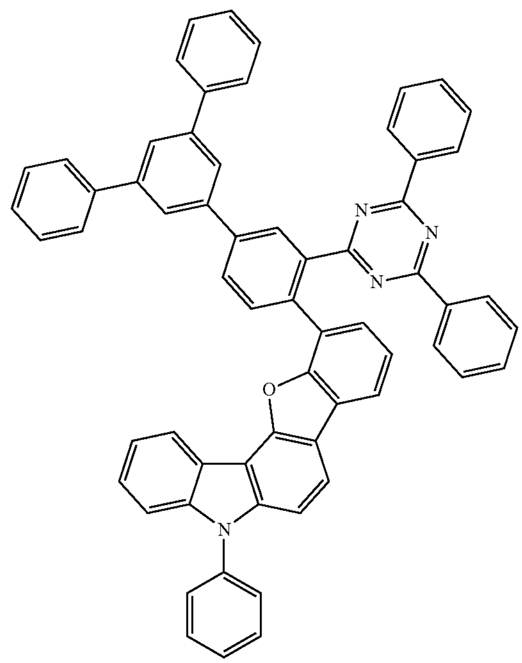

-continued
735
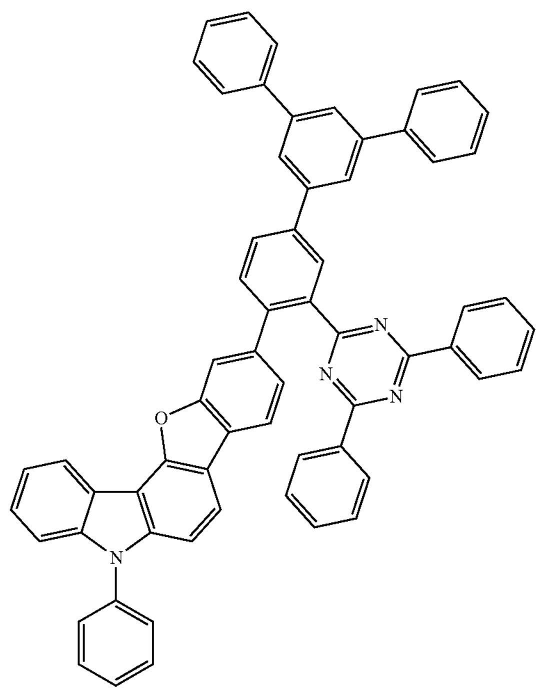
736
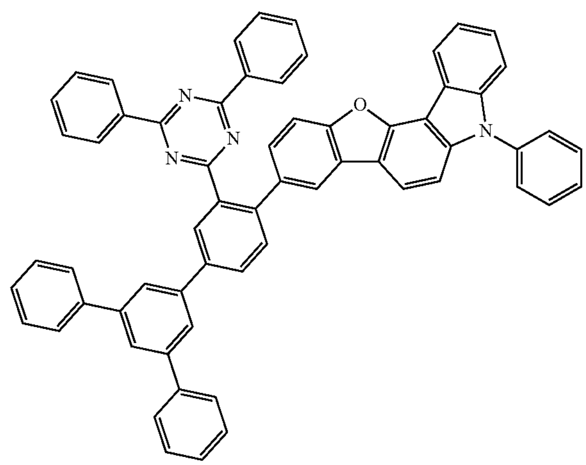
-continued
737
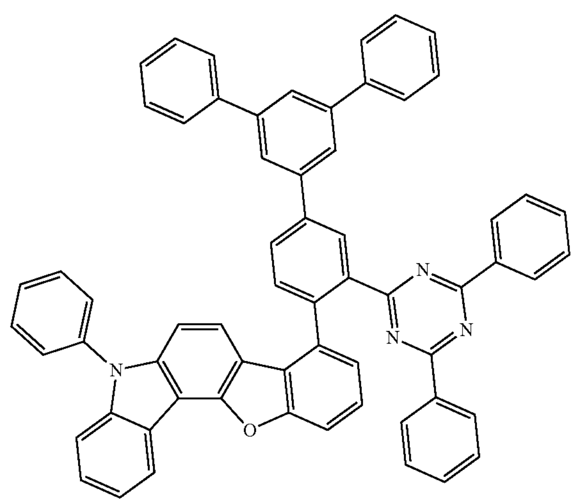
738
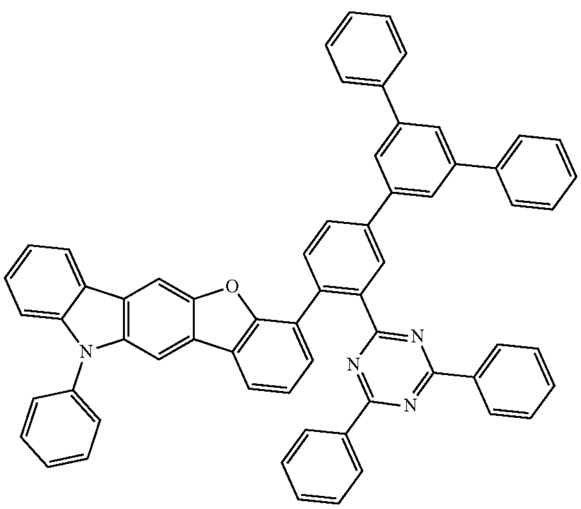

-continued
739
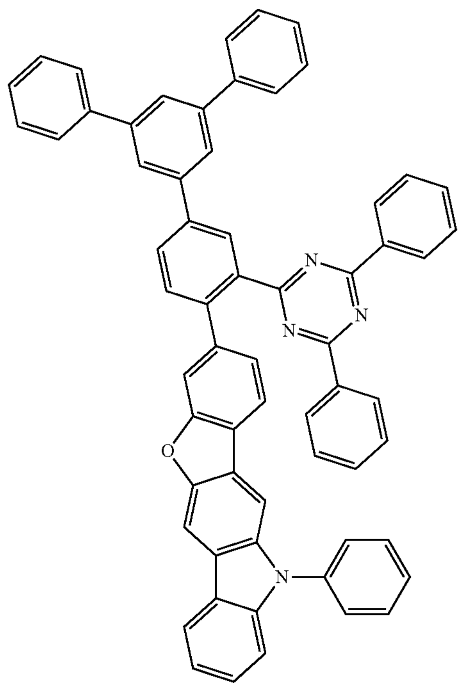
740
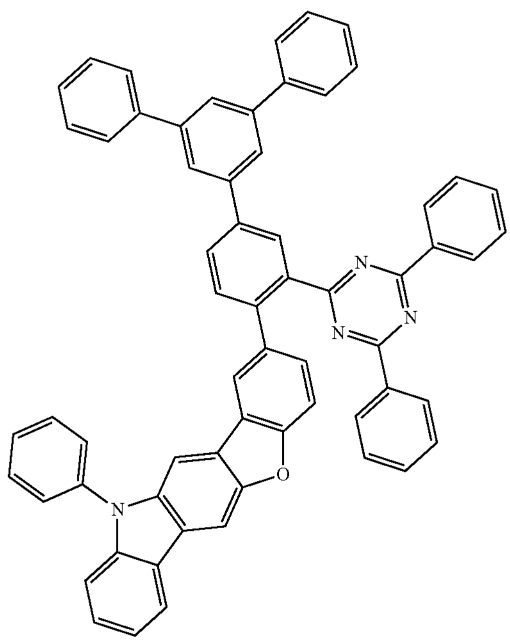
-continued
741
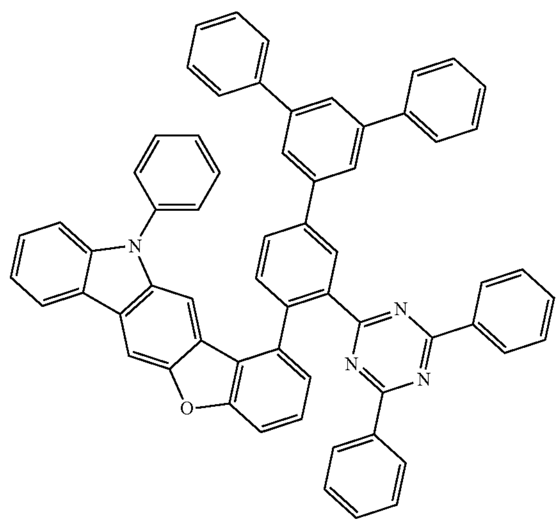
742
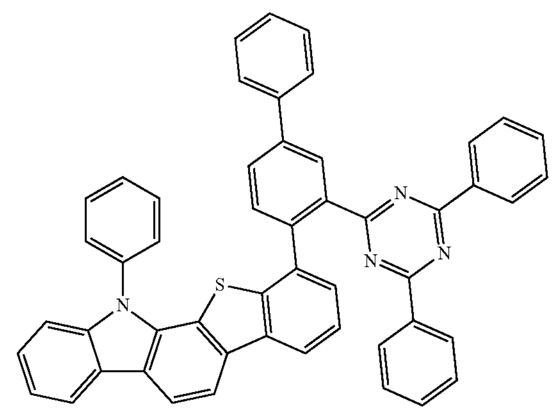
743
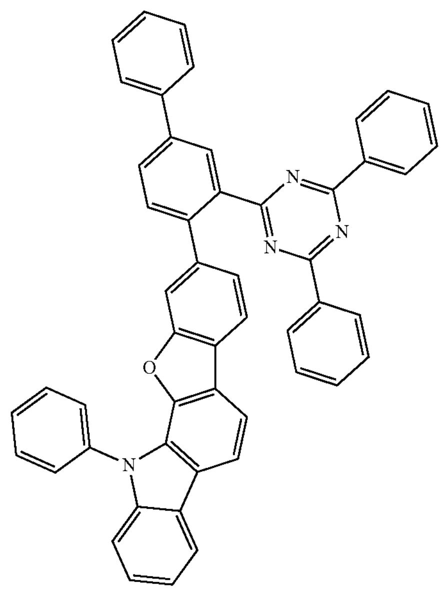

-continued
744
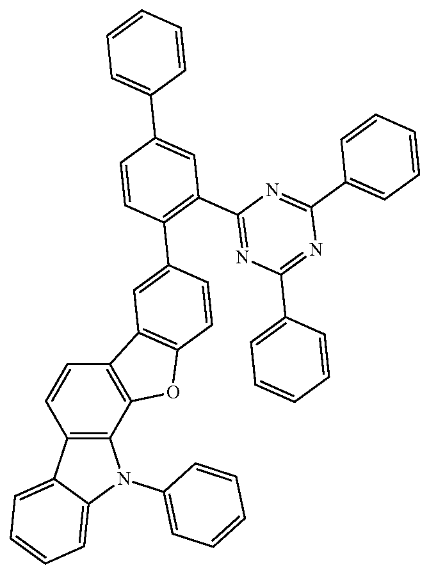
745
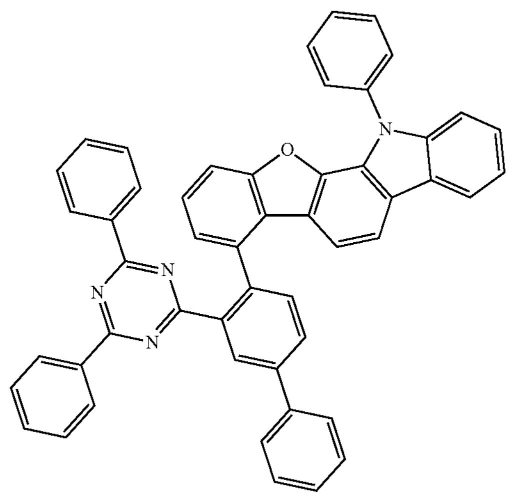
746
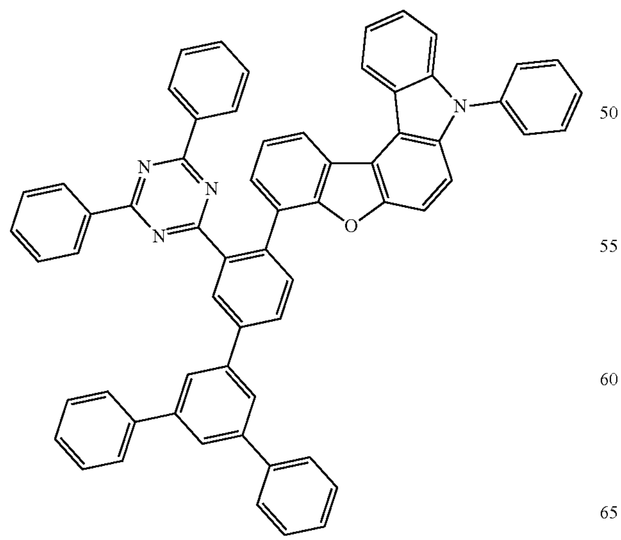
-continued
747
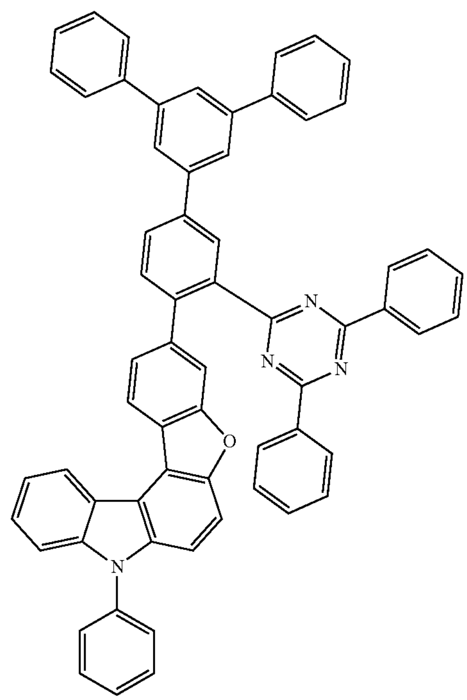
748
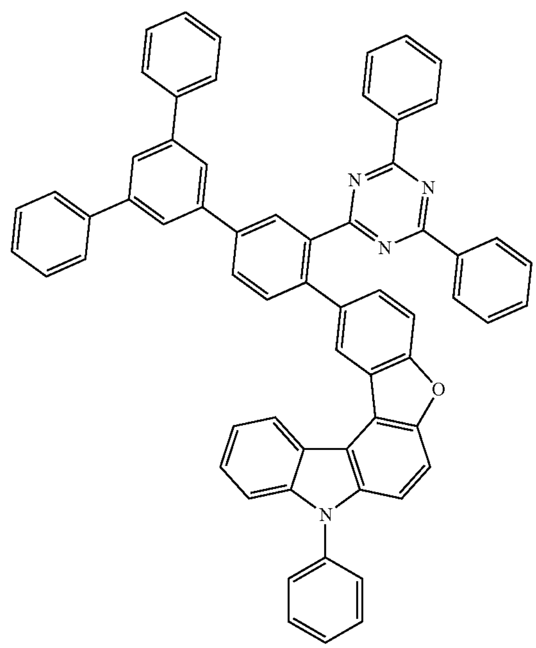

749
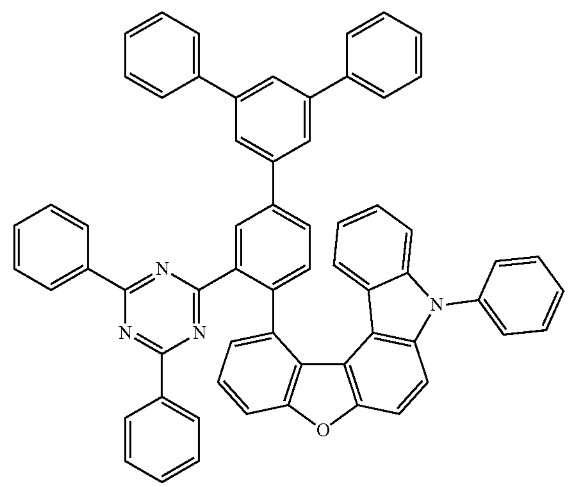
750
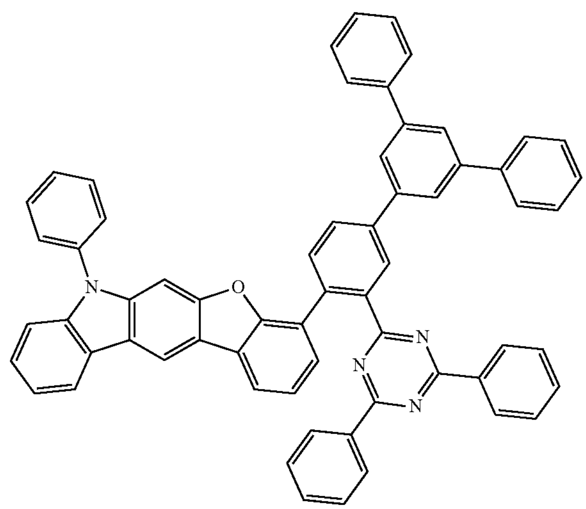
751
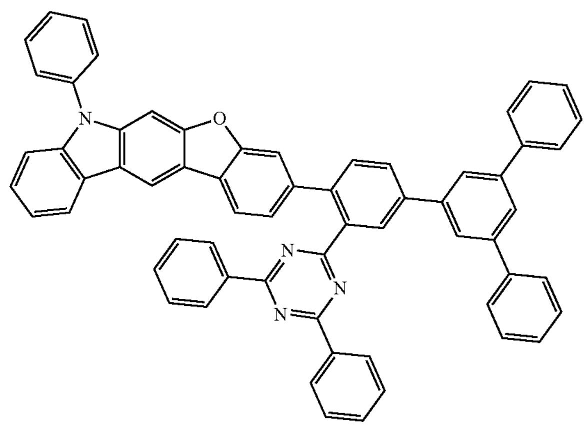
752
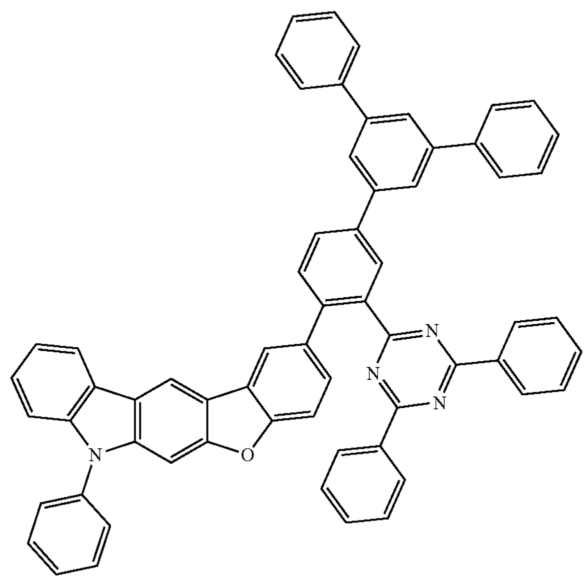
753
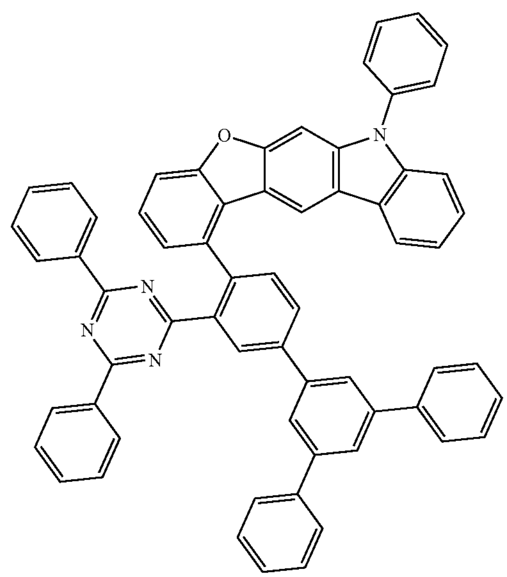

-continued
754
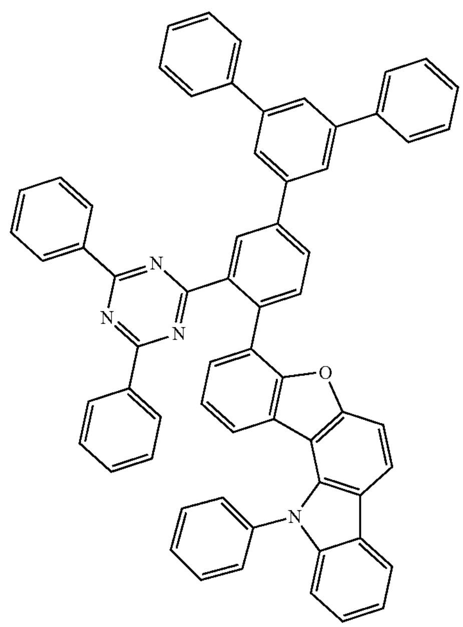
755
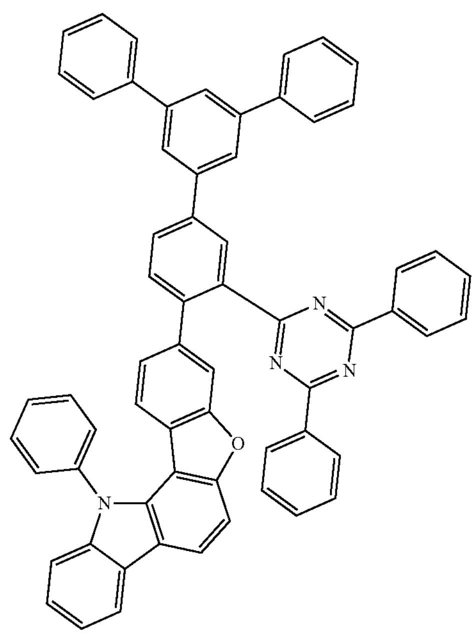
-continued
756
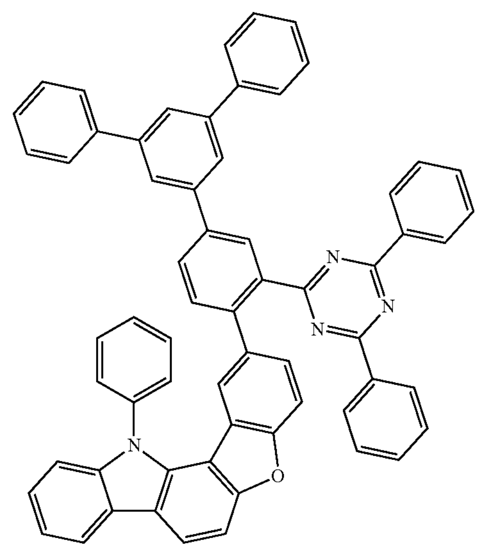
757
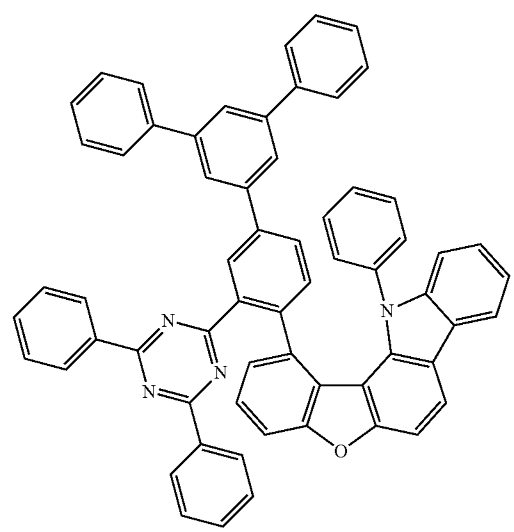

-continued
758
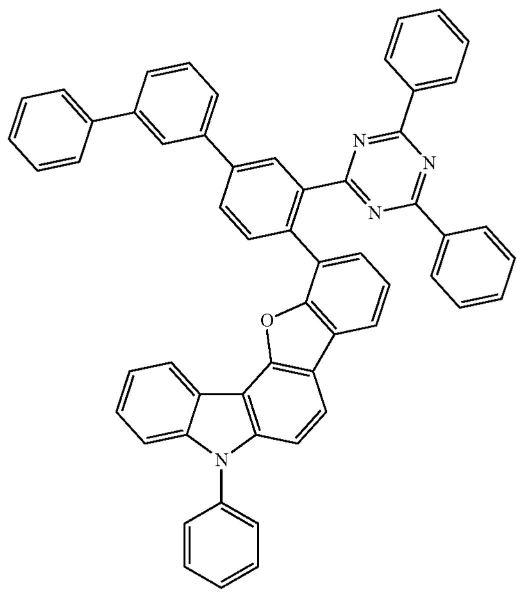
759
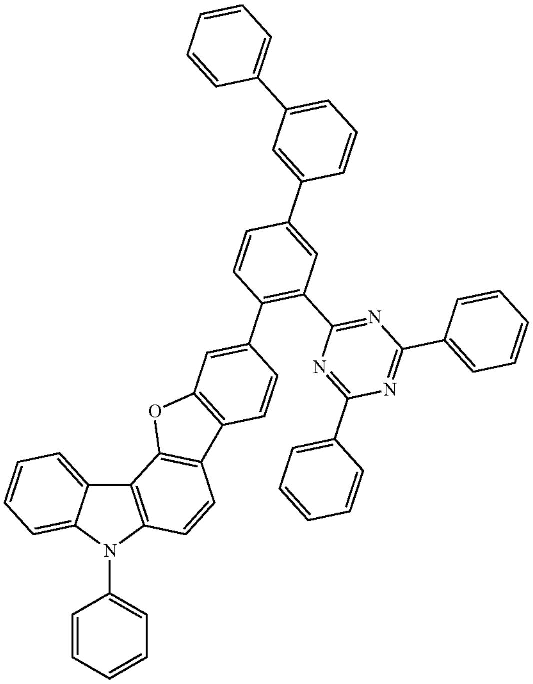
-continued
760
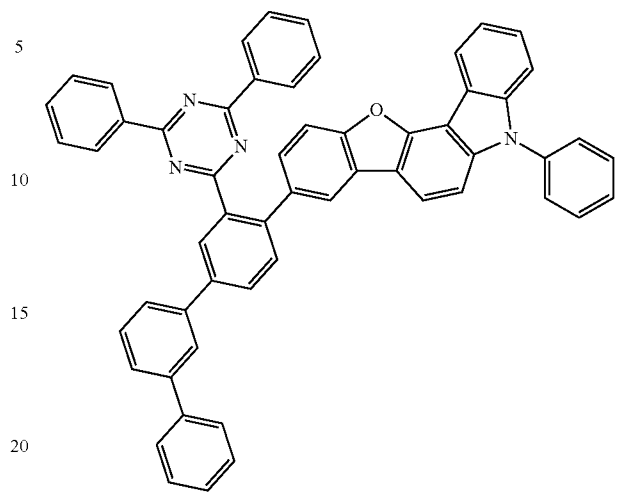
761
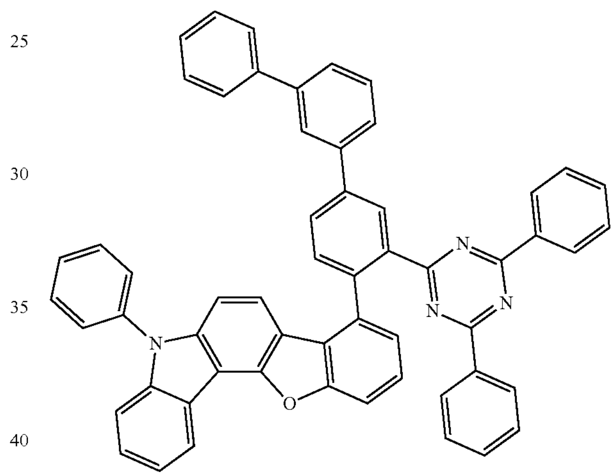
762
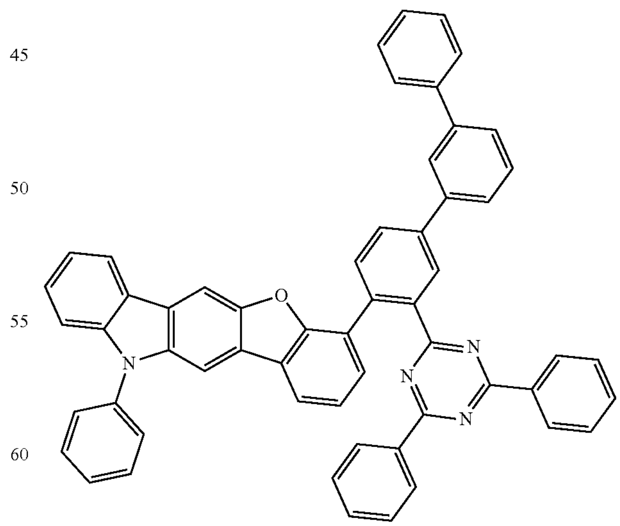

-continued
763
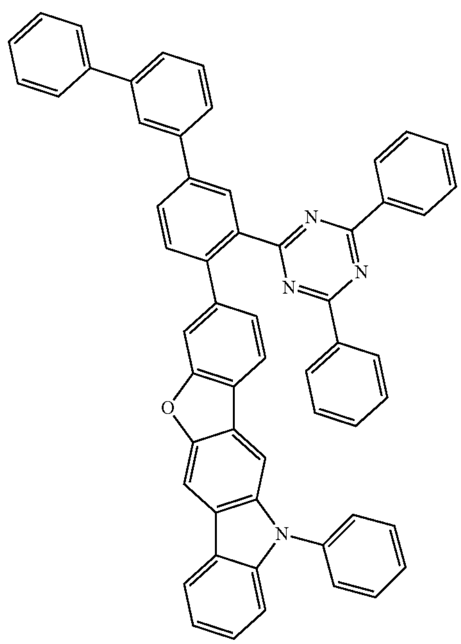
765
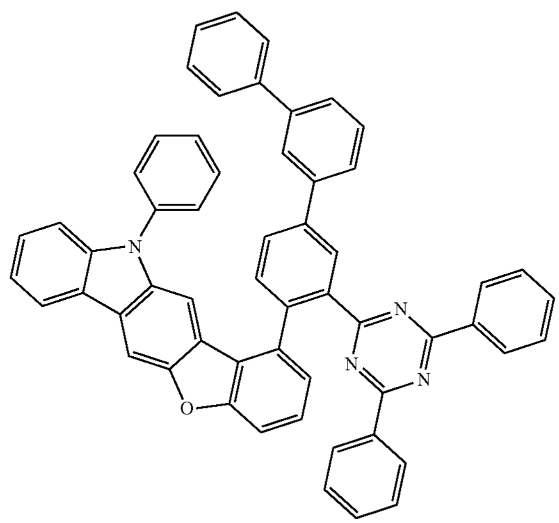
764
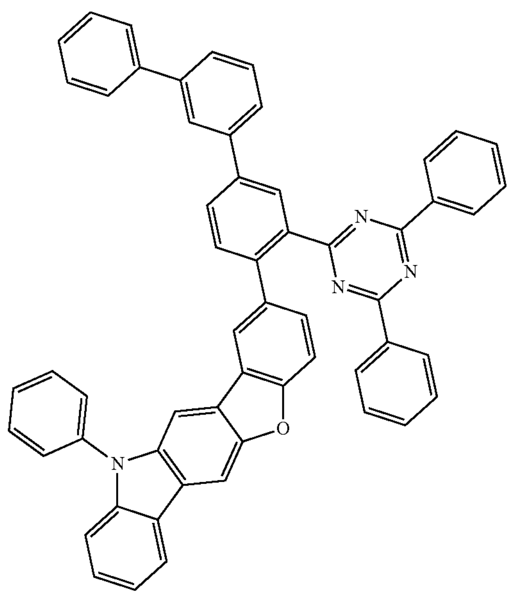
766
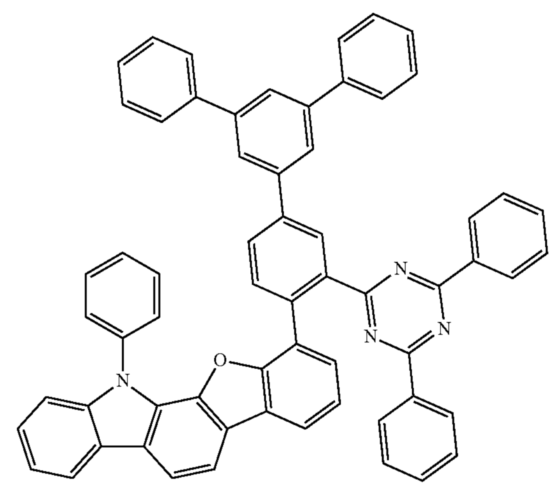

-continued
767
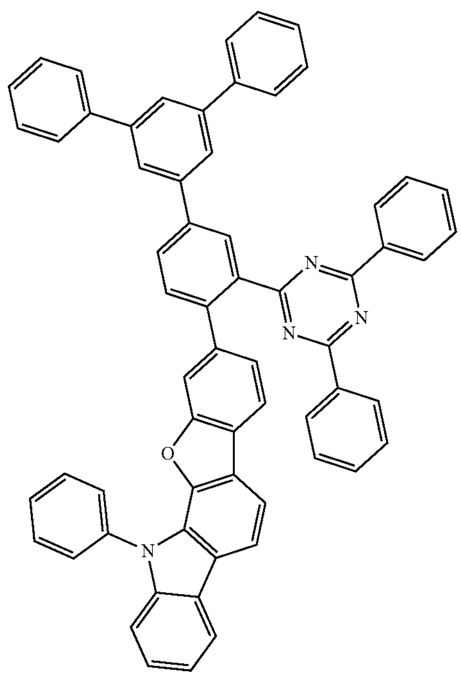
768
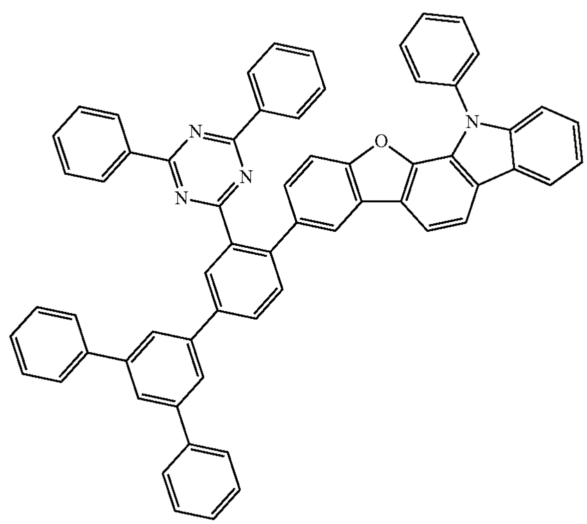
-continued
769
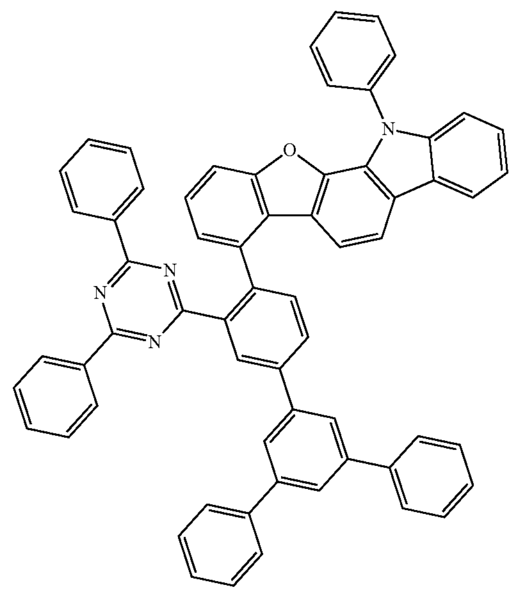
770
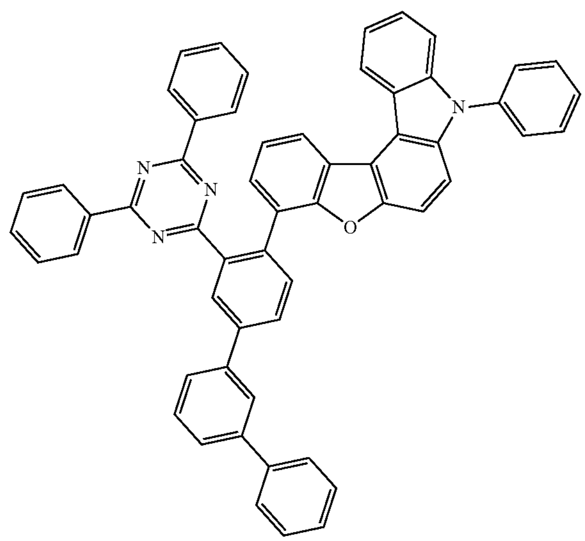

-continued
771
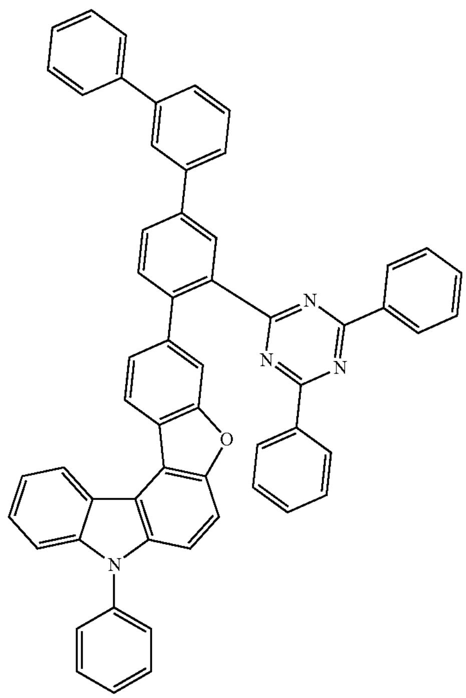
772
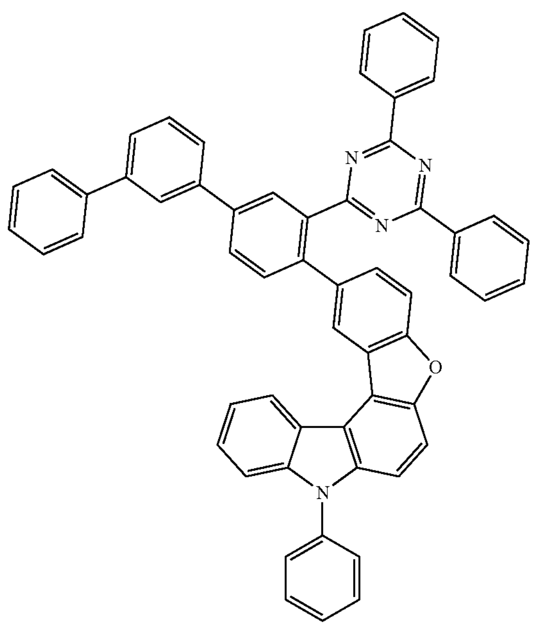
-continued
773
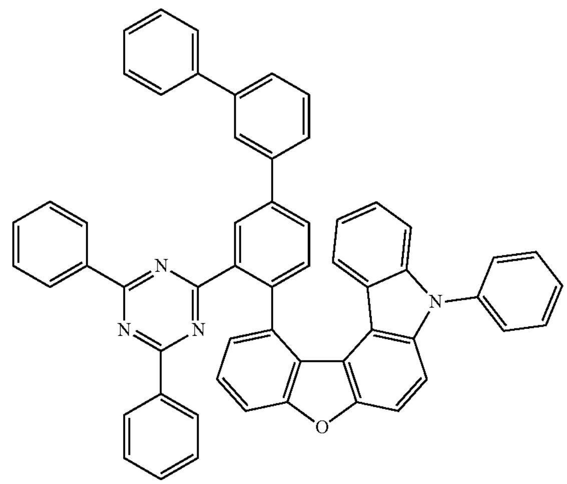
774
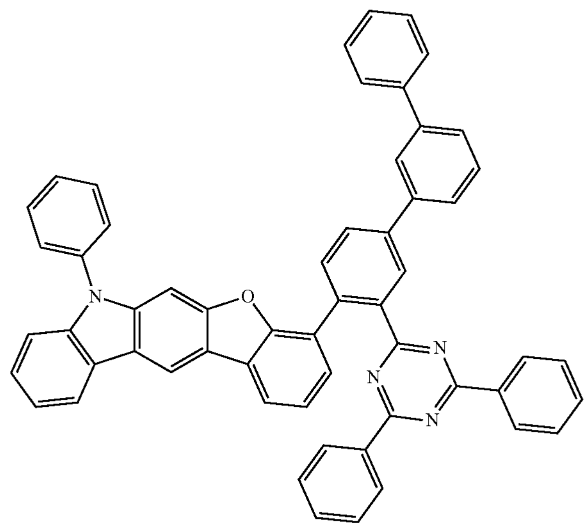
775
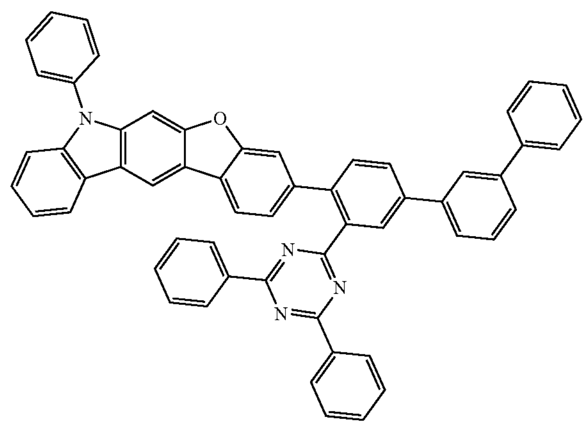

-continued
776
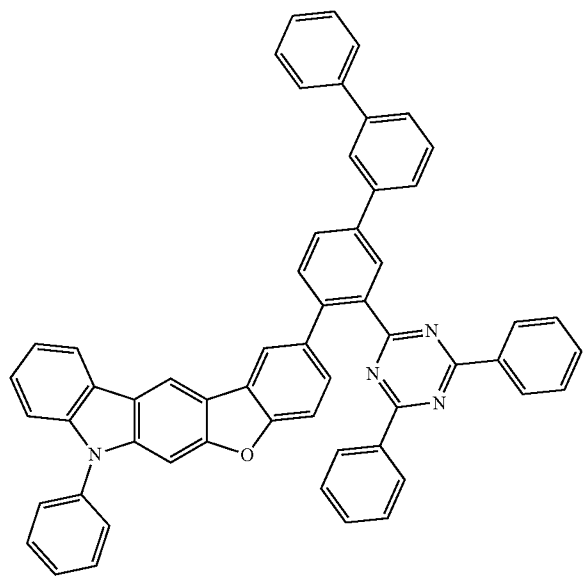
777
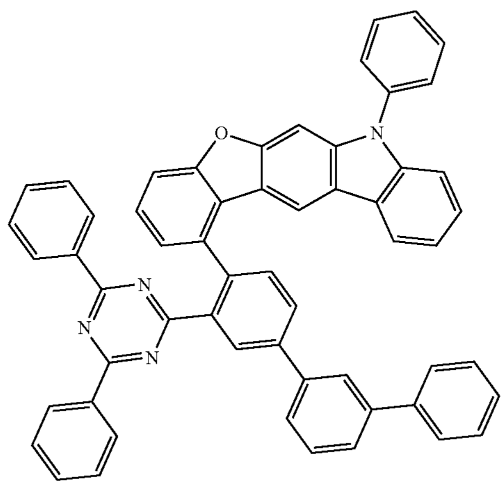
778
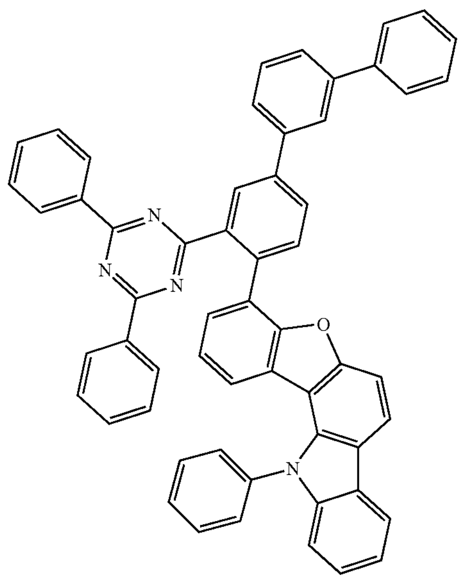
-continued
779
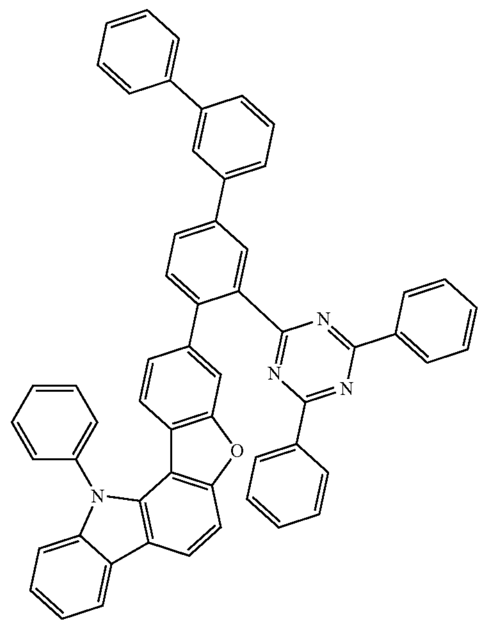
780
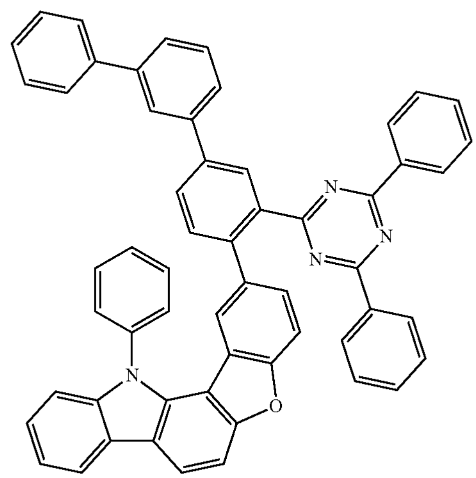
781
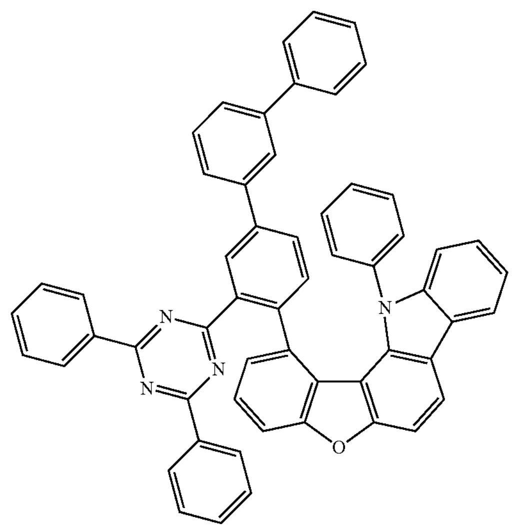

-continued
782
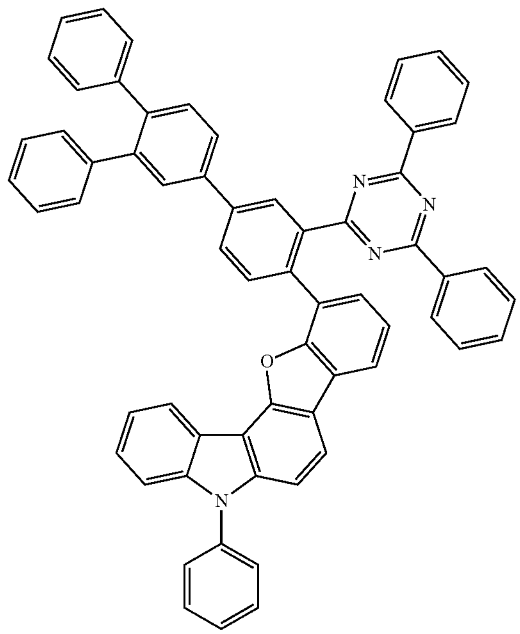
783
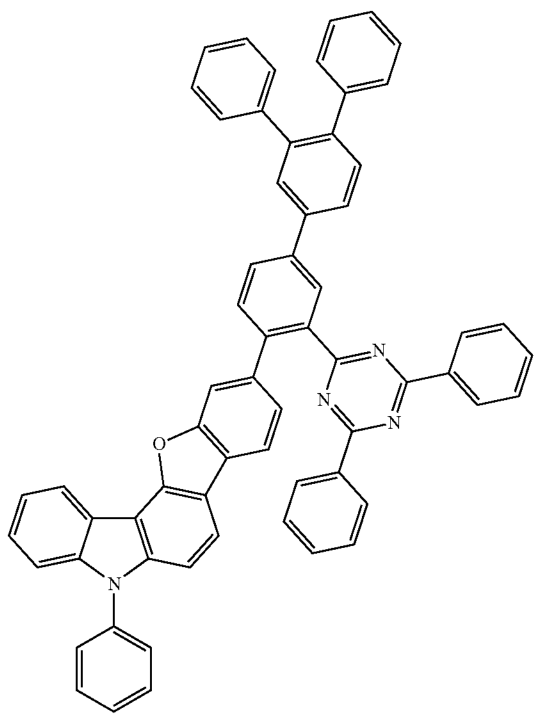
-continued
784
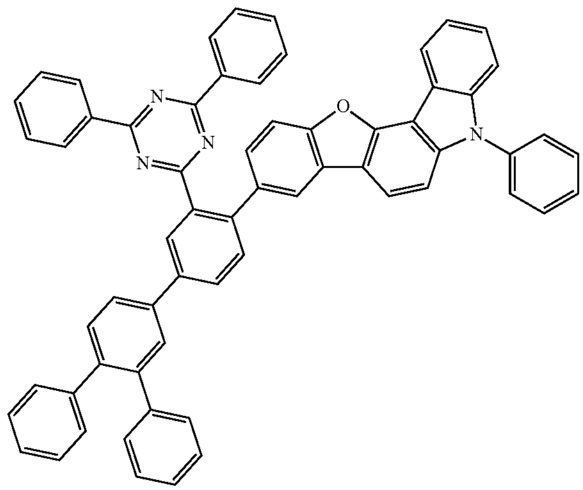
785
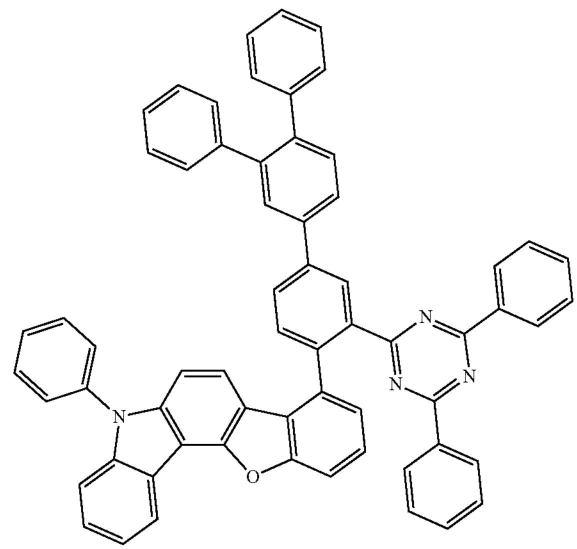
786
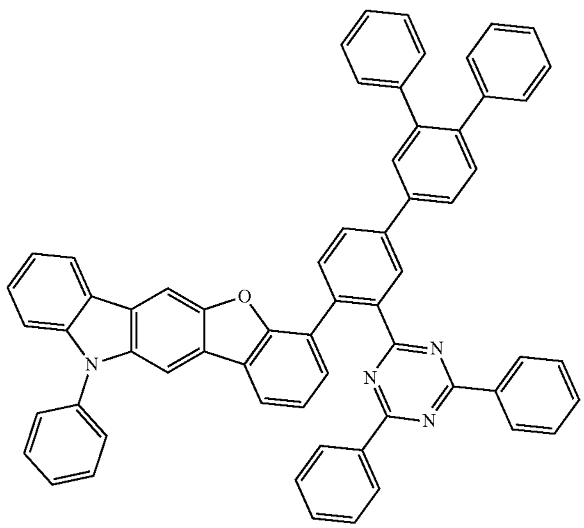

-continued
787
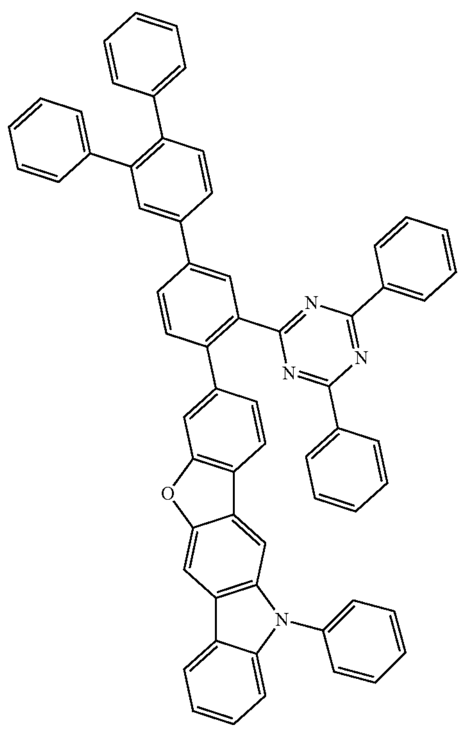
788
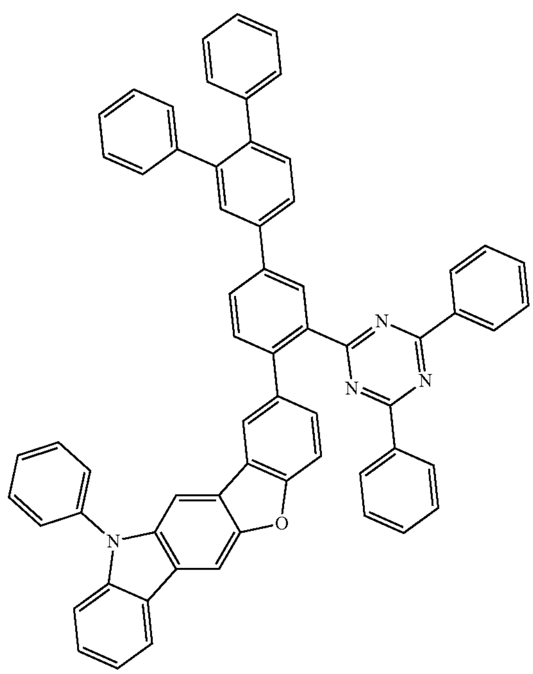
-continued
789
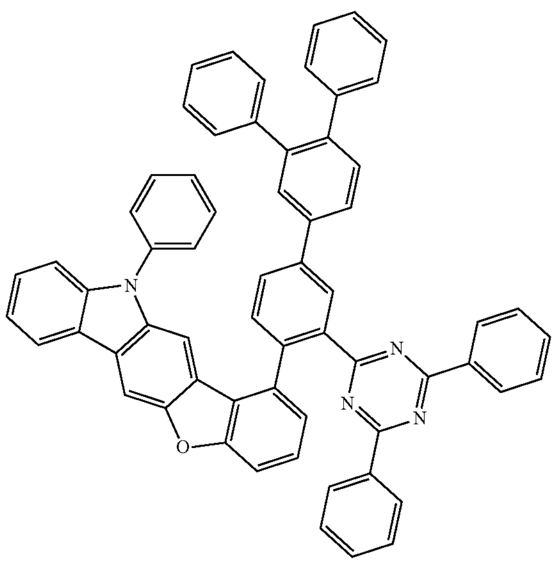
790
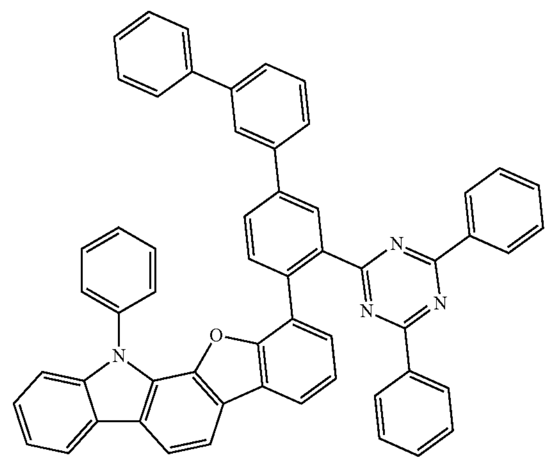

-continued
791
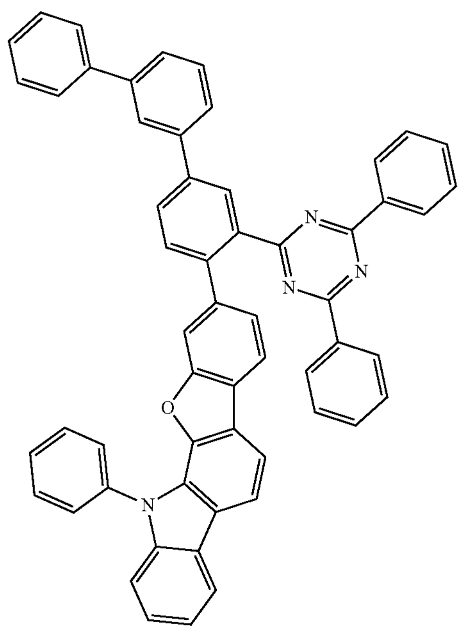
792
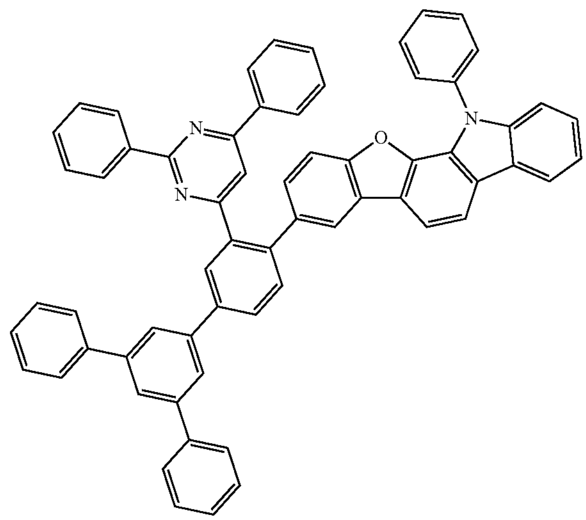
-continued
793
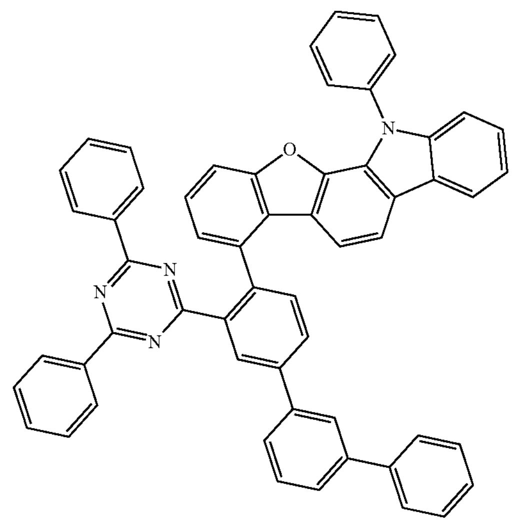
794
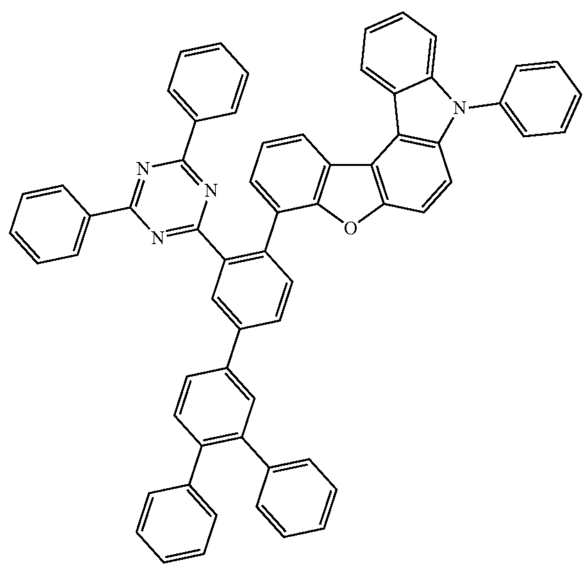

-continued
795
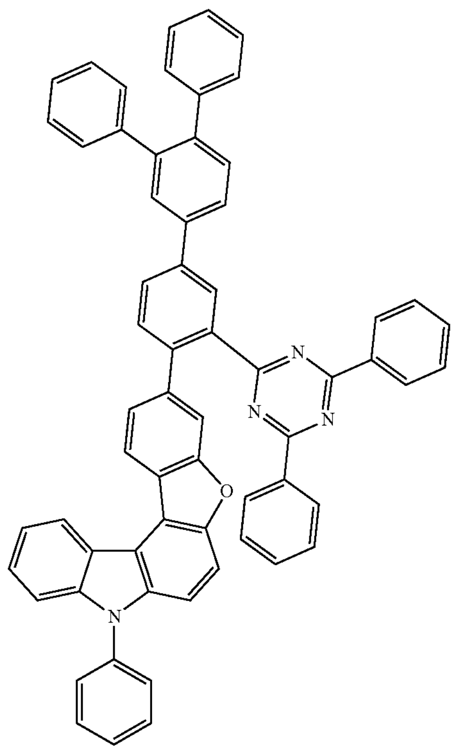
796
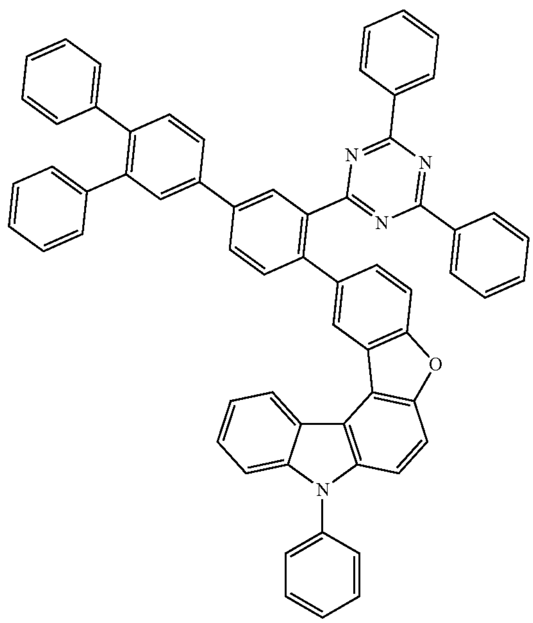
-continued
797
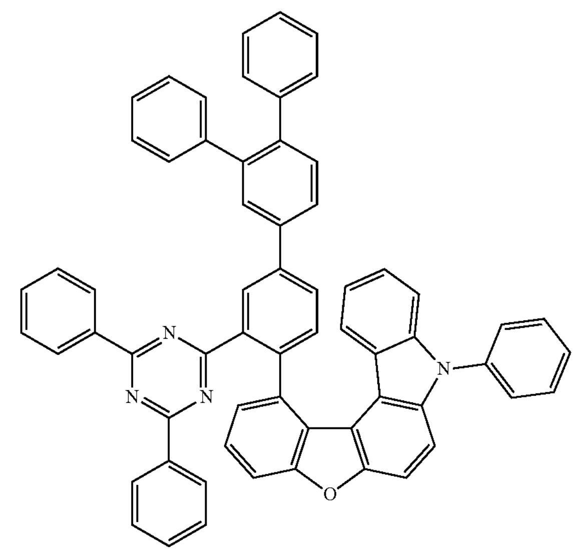
798
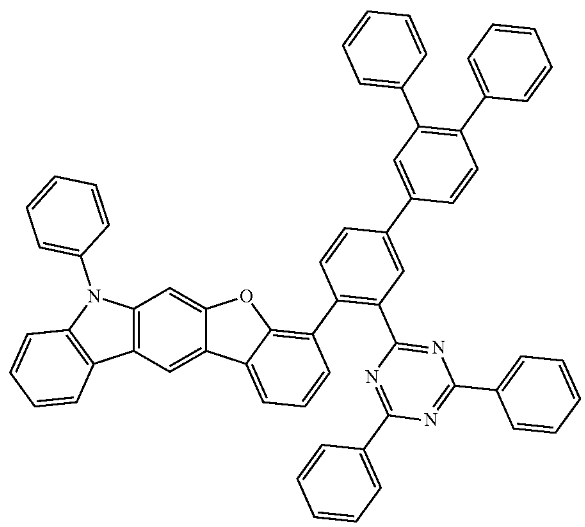
799
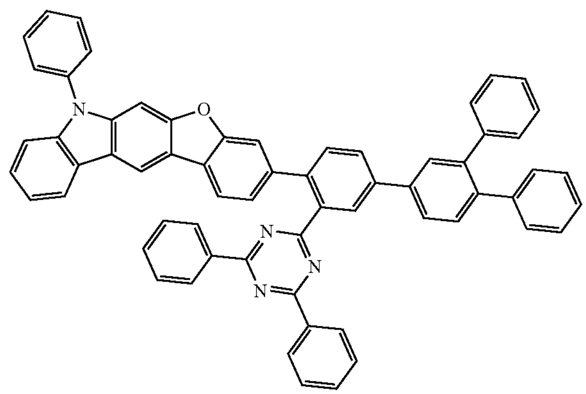

-continued
800
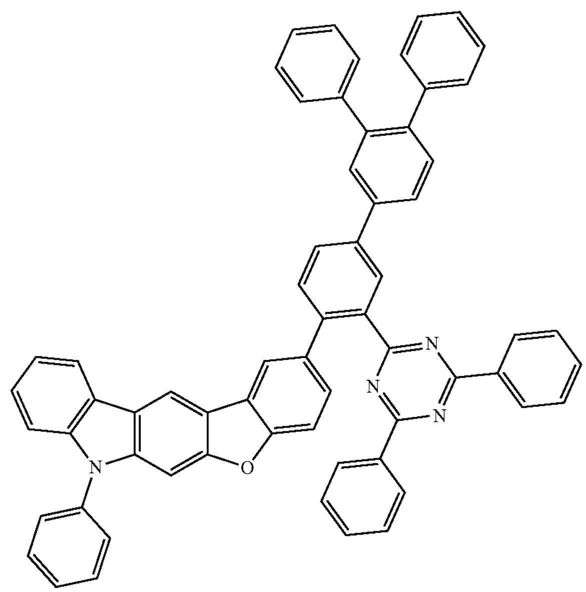
801
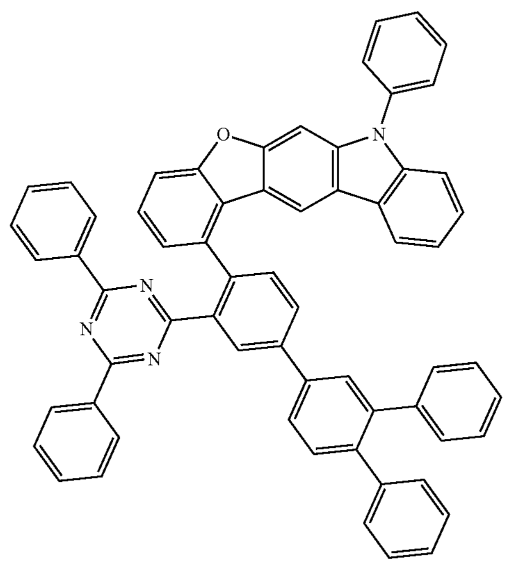
-continued
802
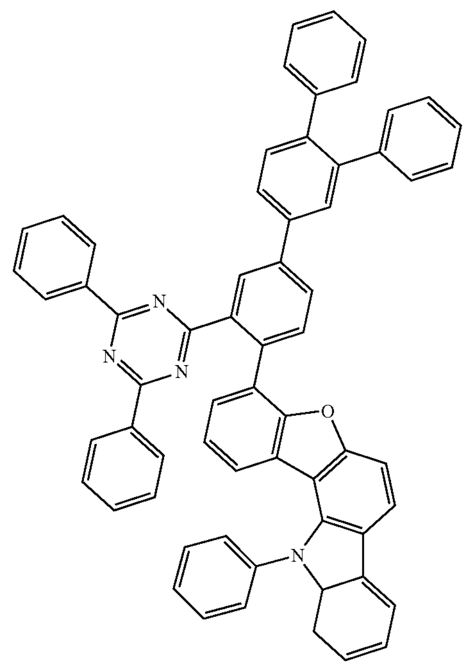
803
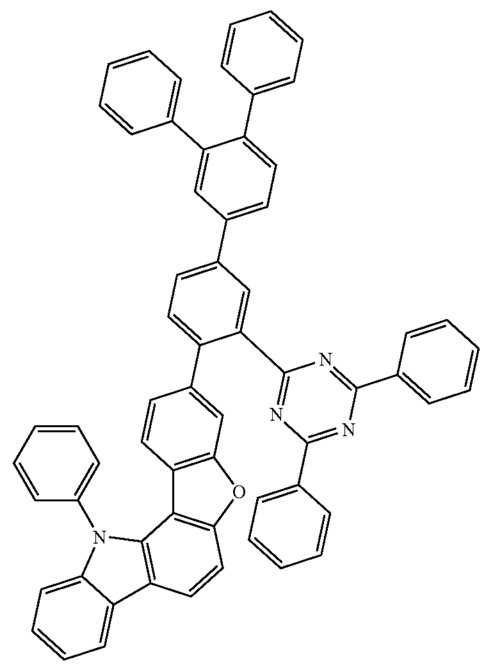

-continued
804
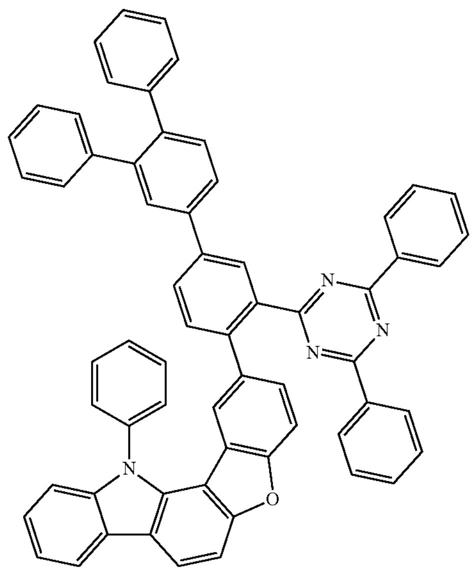
805
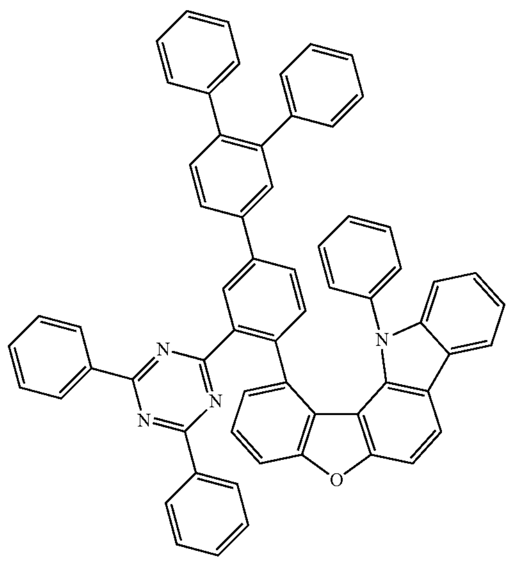
-continued
806
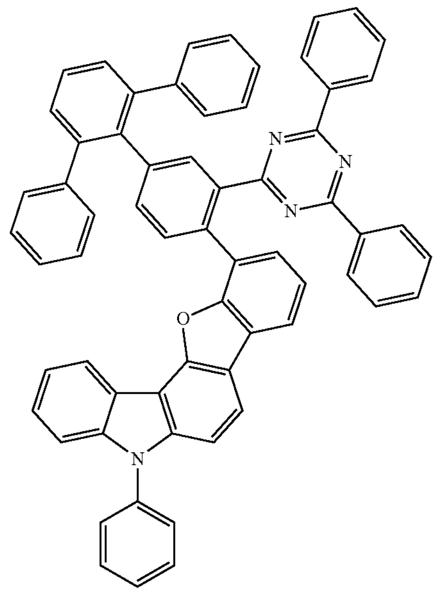
807
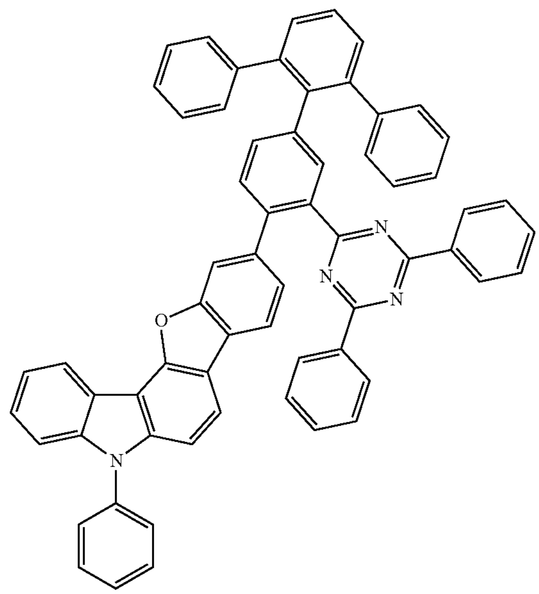
808
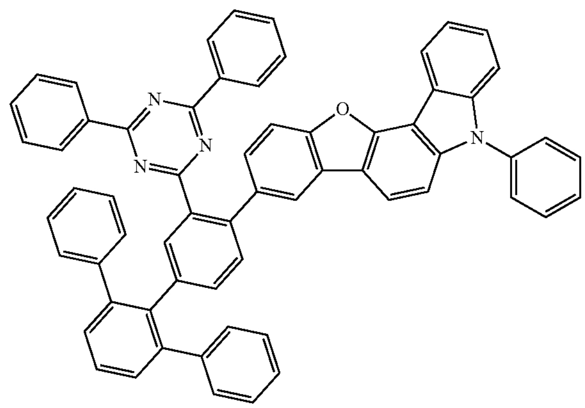

-continued
809
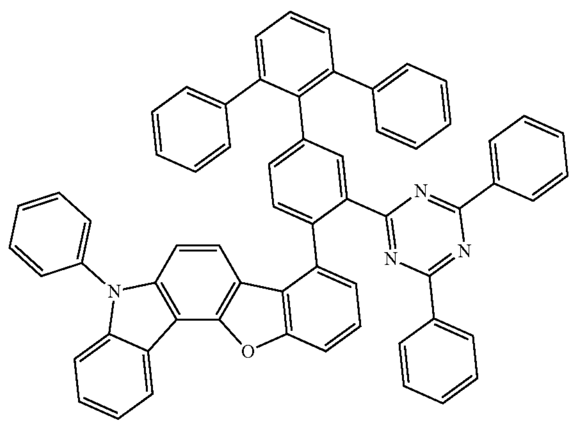
810
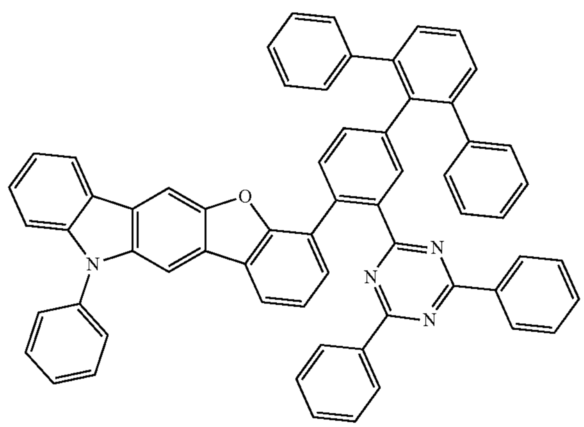
811
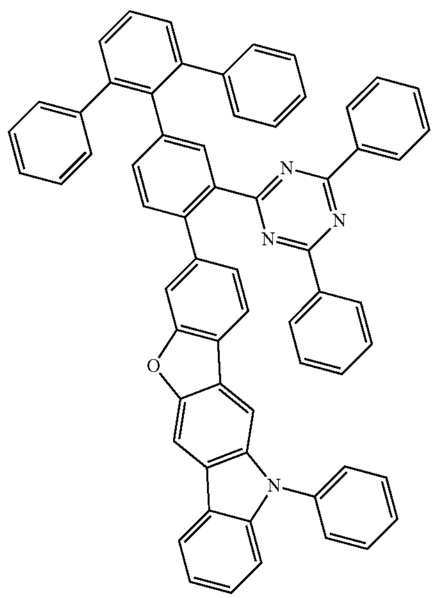
-continued
812
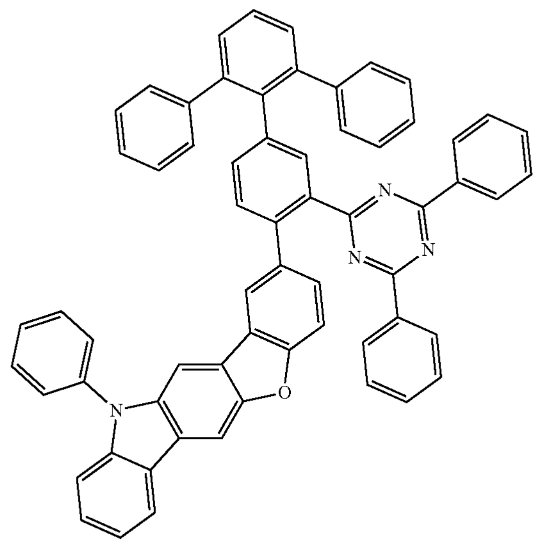
813
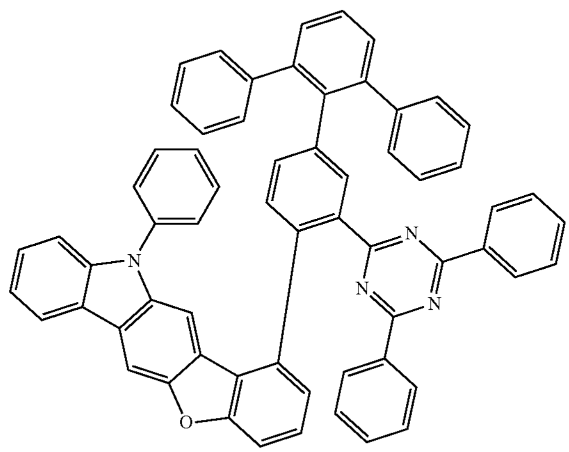
814
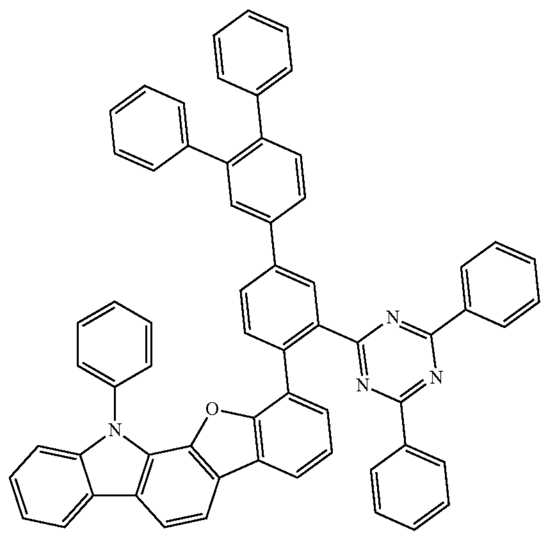

-continued
815
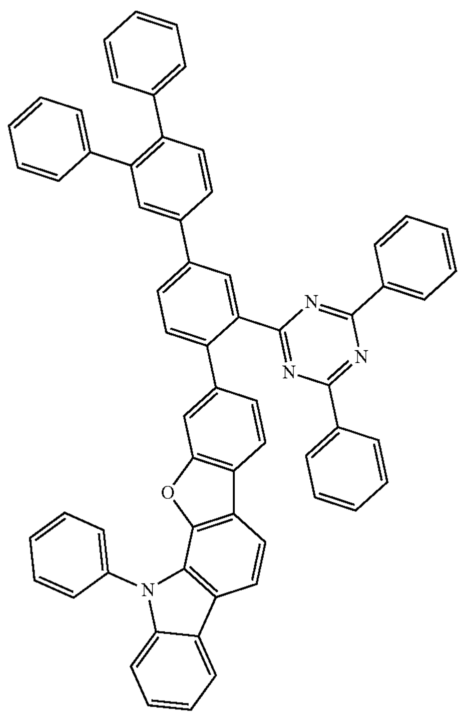
816
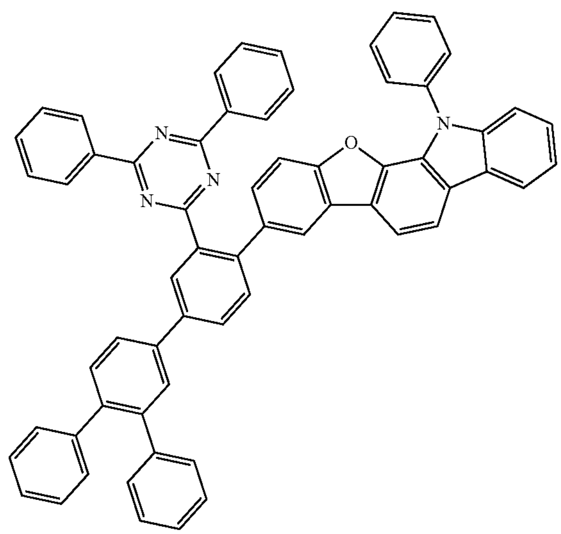
-continued
817
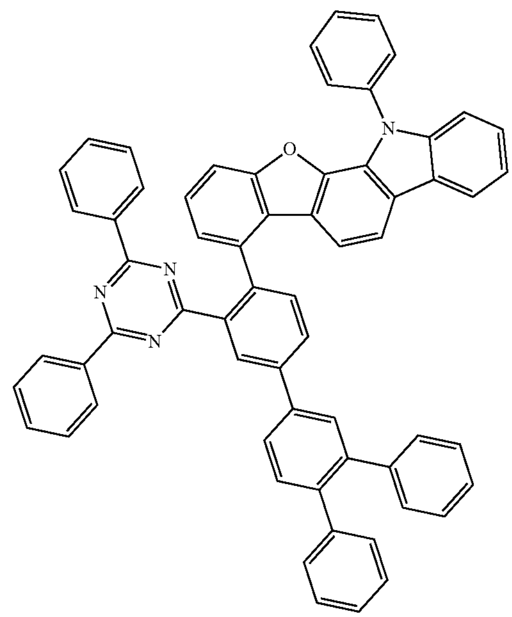
818
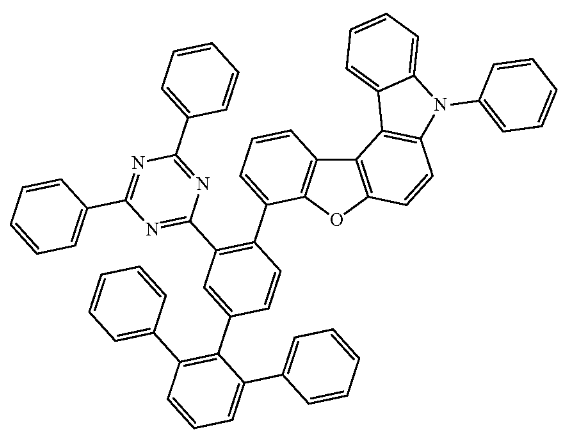

-continued
819
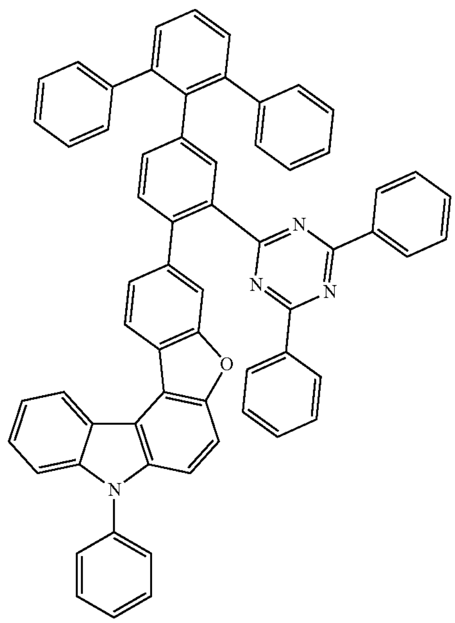
820
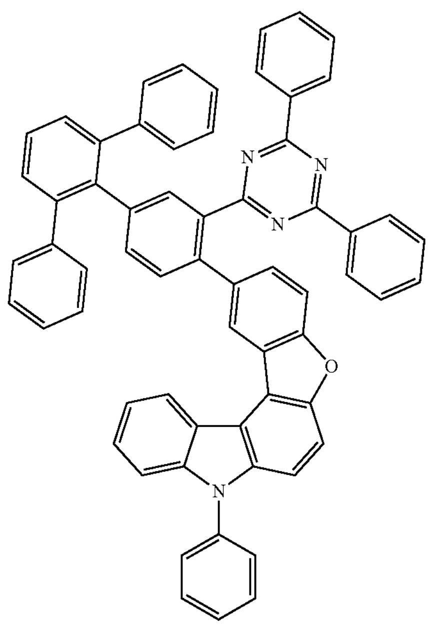
-continued
821
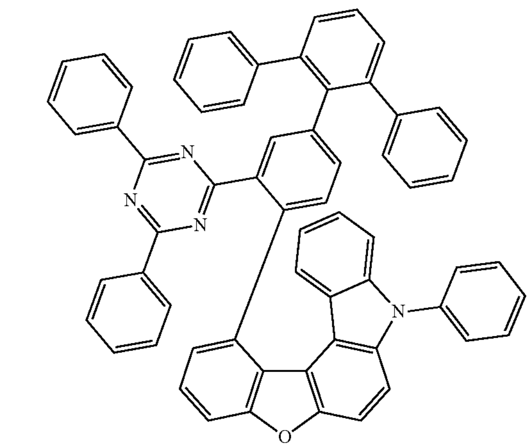
822
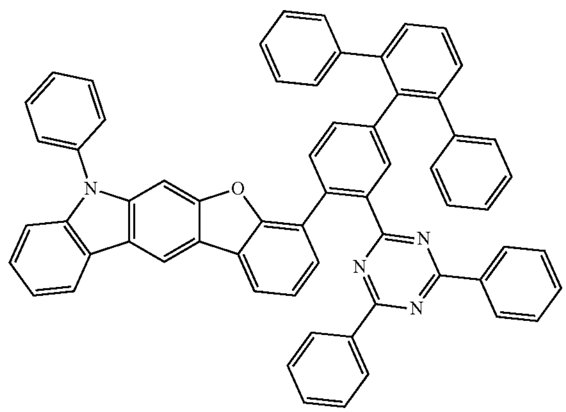
823
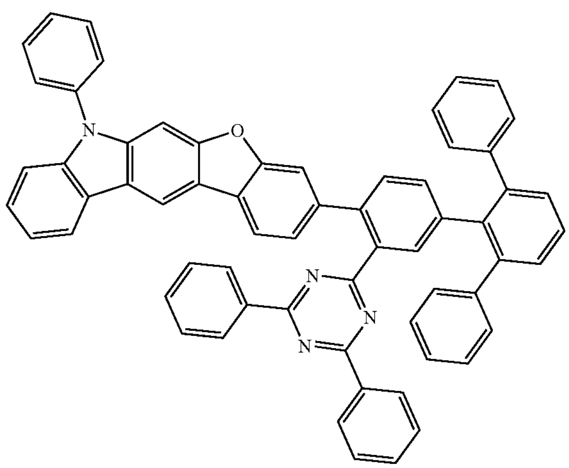

-continued
824
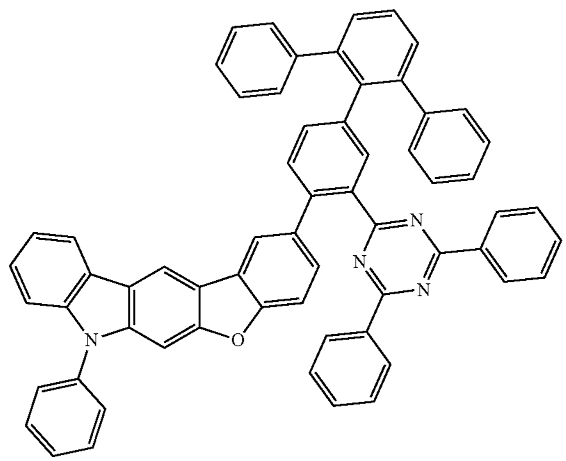
825
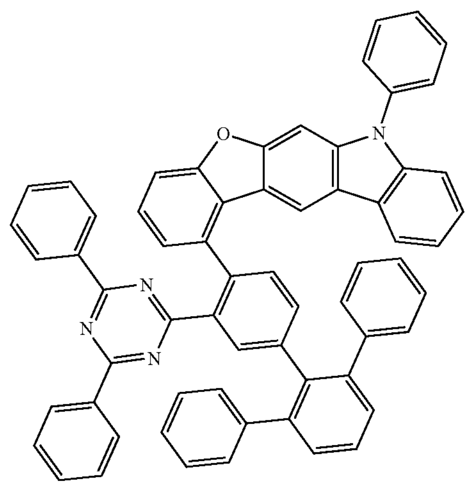
826
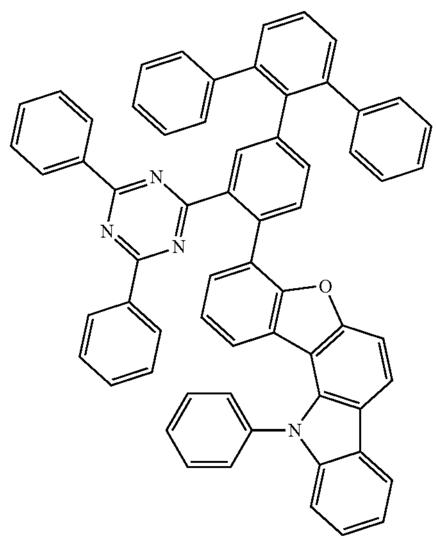
-continued
827
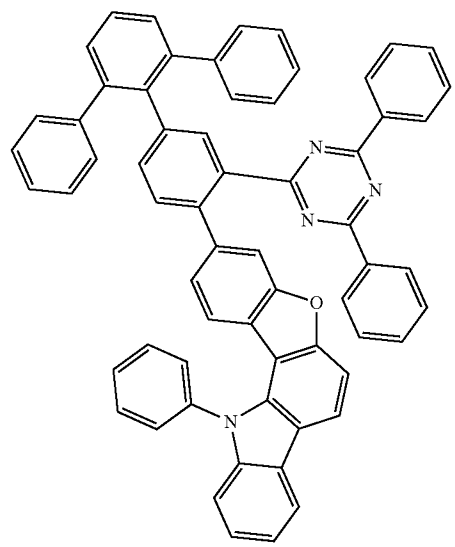
828
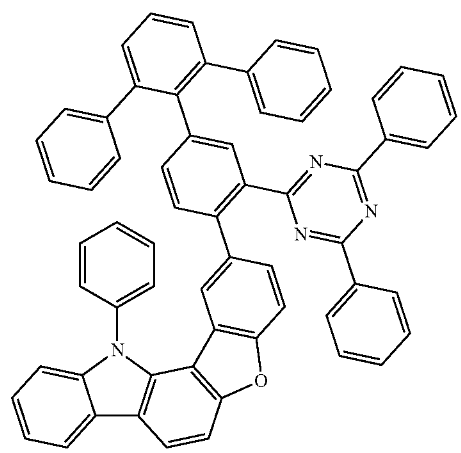
829
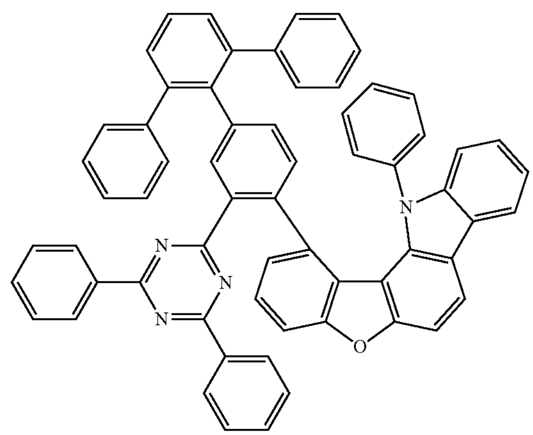

-continued
830
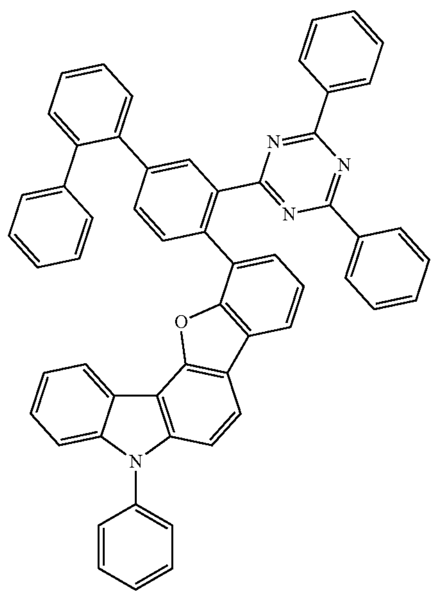
831
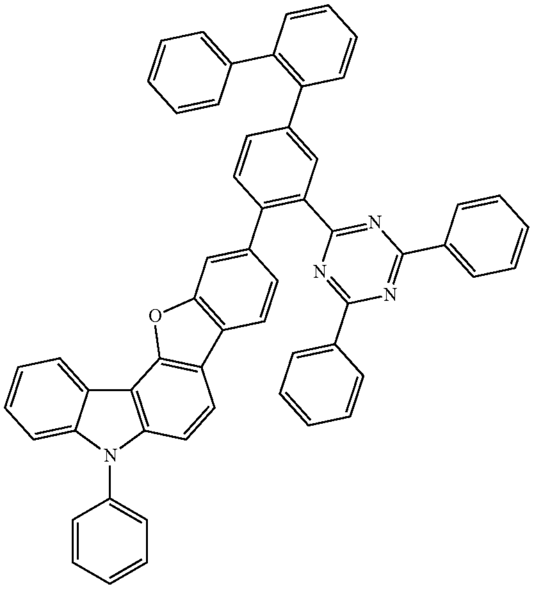
832
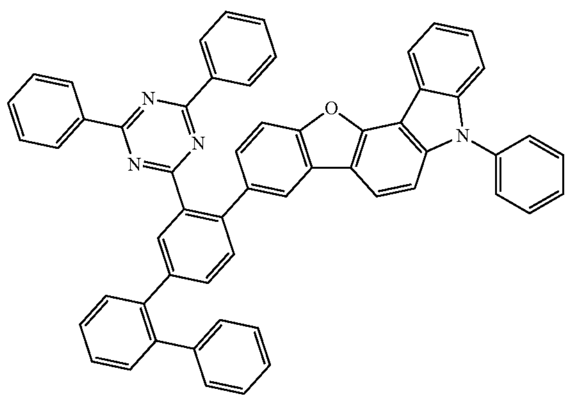
-continued
833
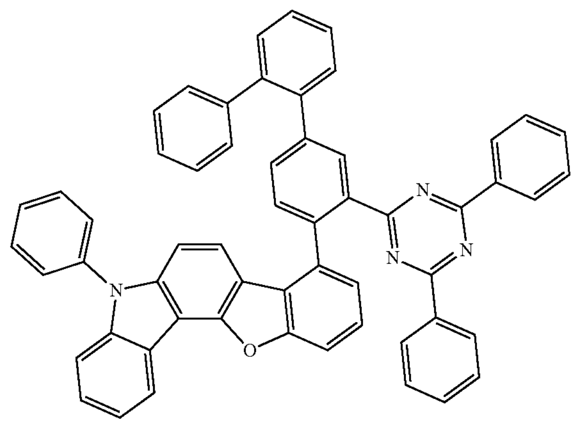
834
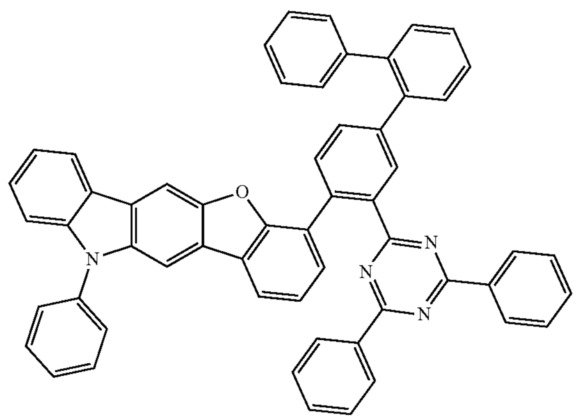
835
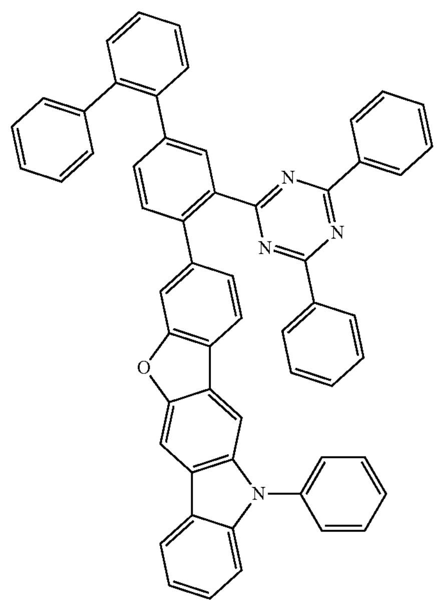

836
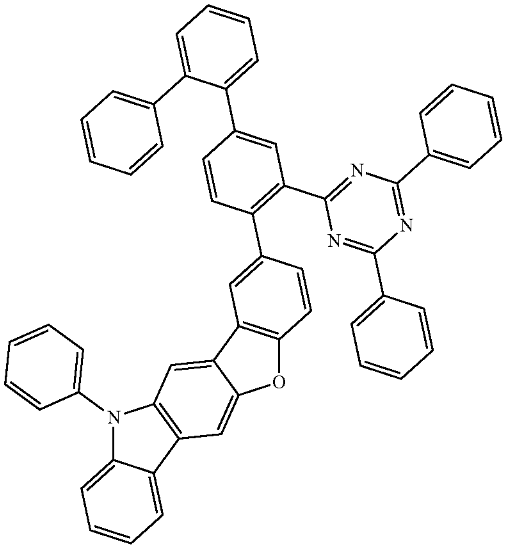
837
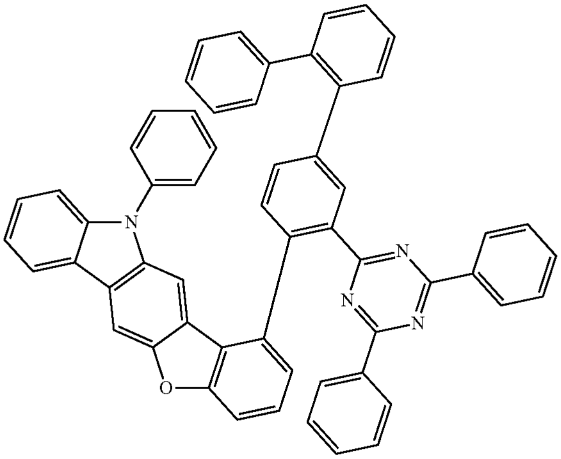
838
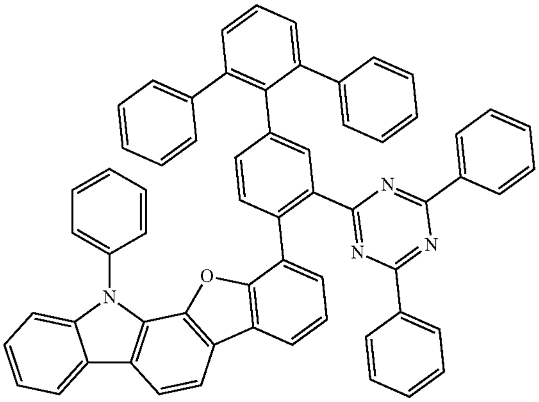
839
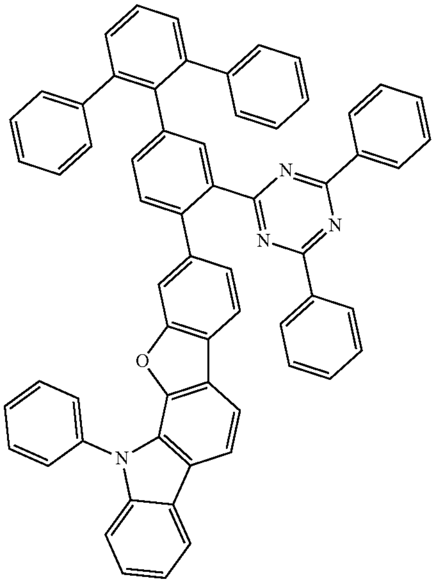
840
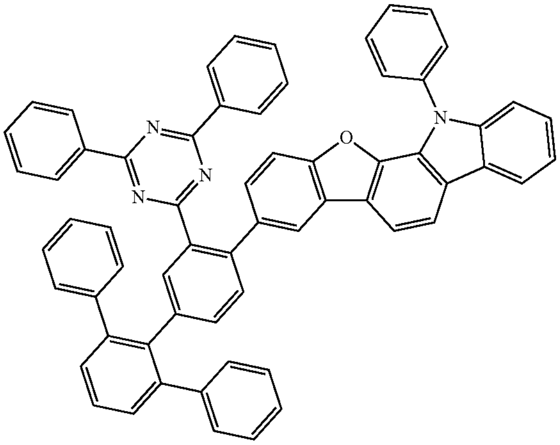
841
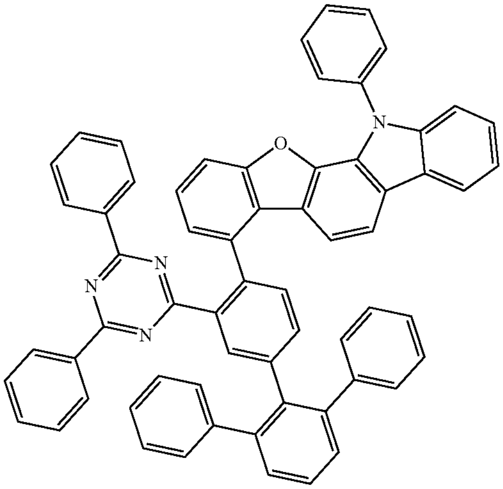

-continued
842
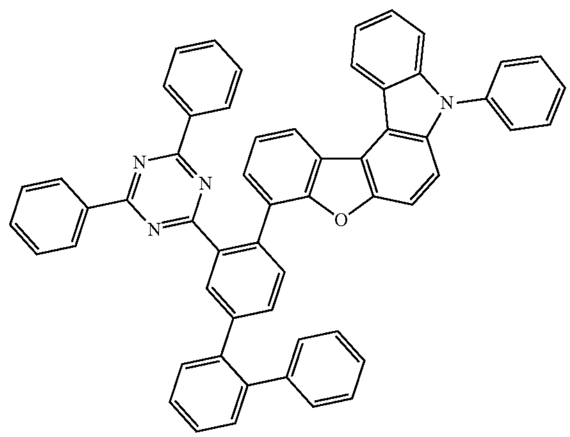
843
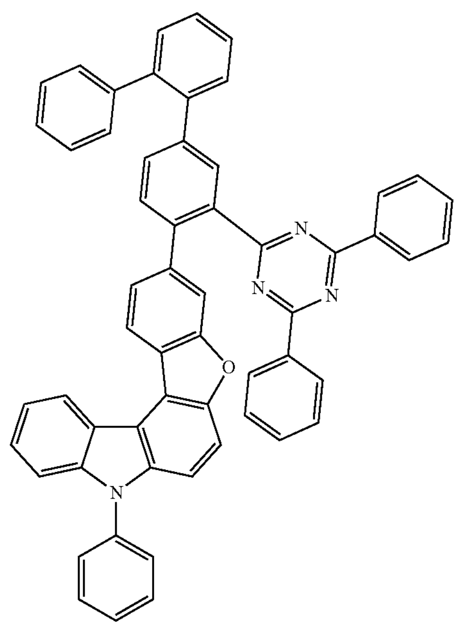
-continued
844
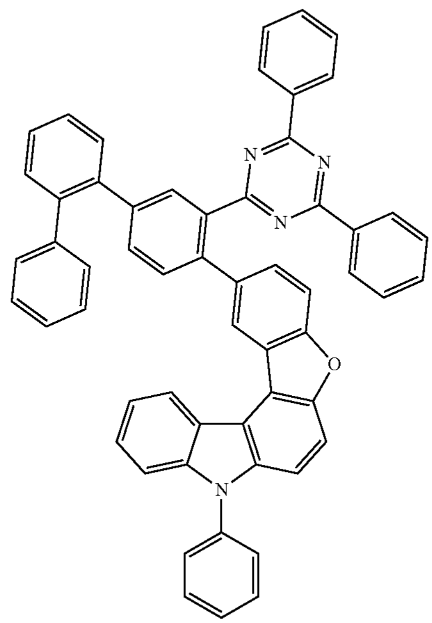
845
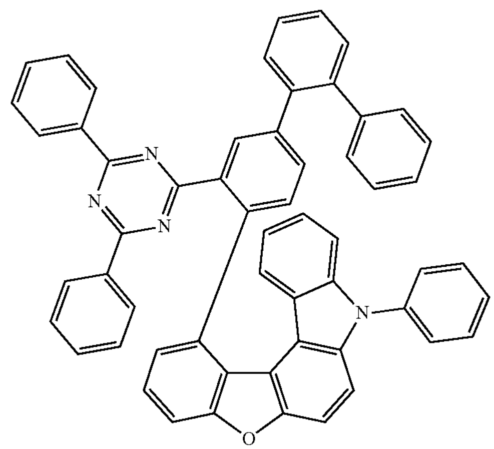
846
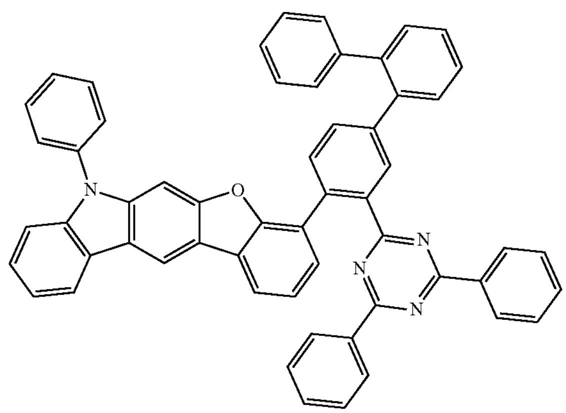

-continued
847
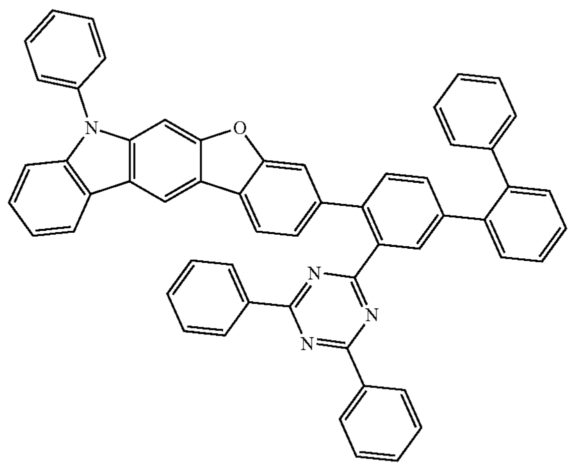
848
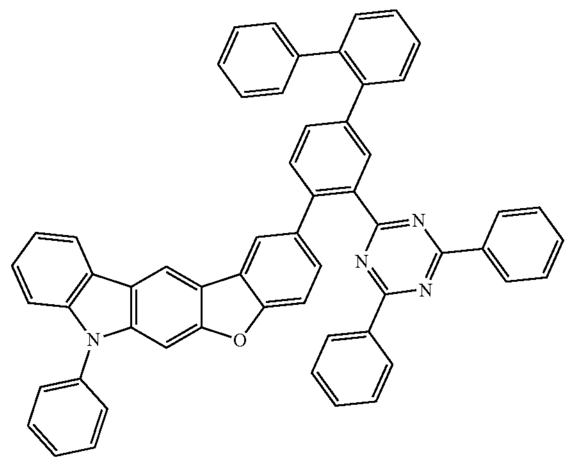
849
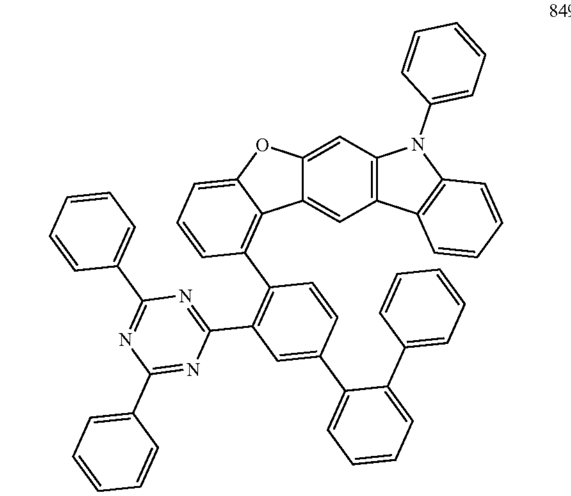
-continued
850
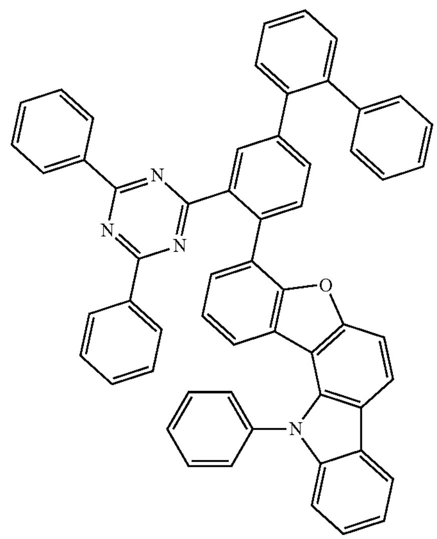
851
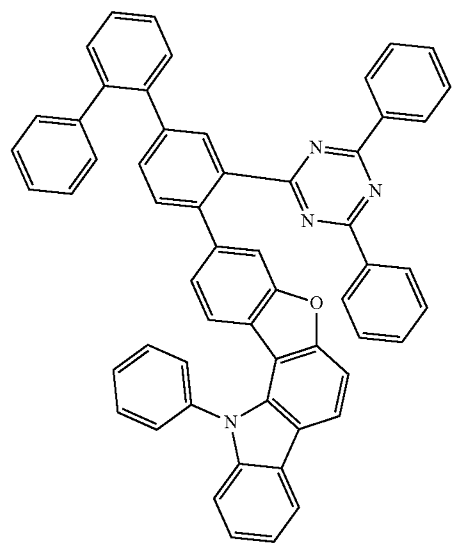
852
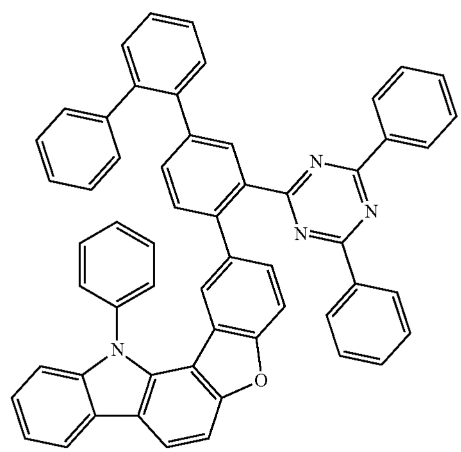

-continued
853
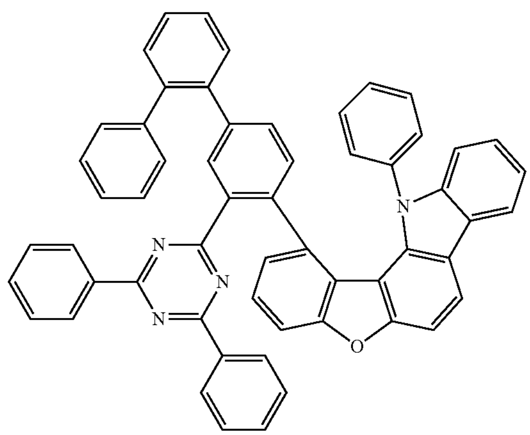
854
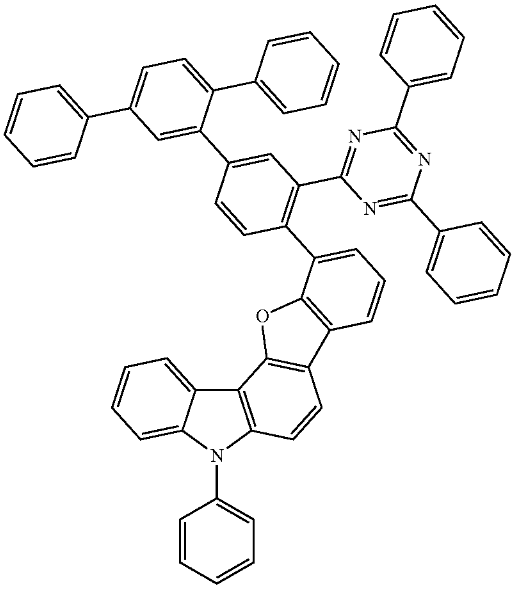
-continued
855
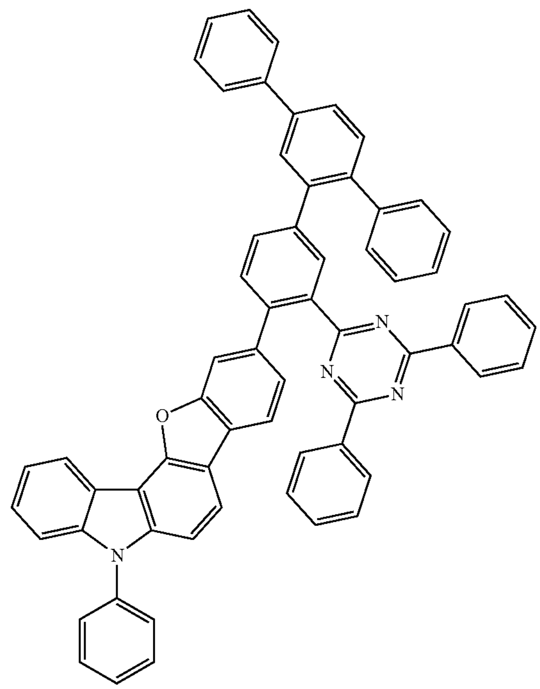
856
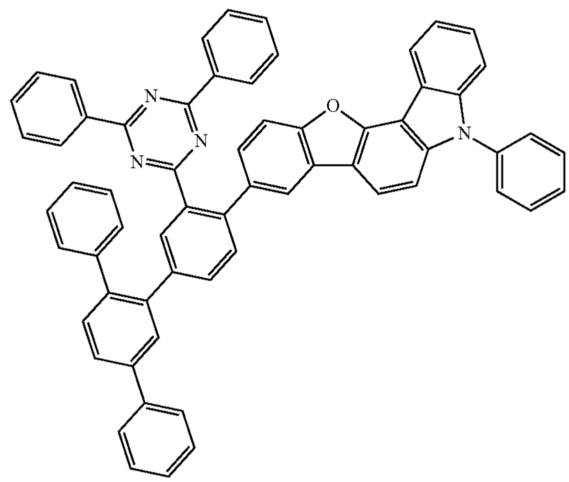

-continued
857
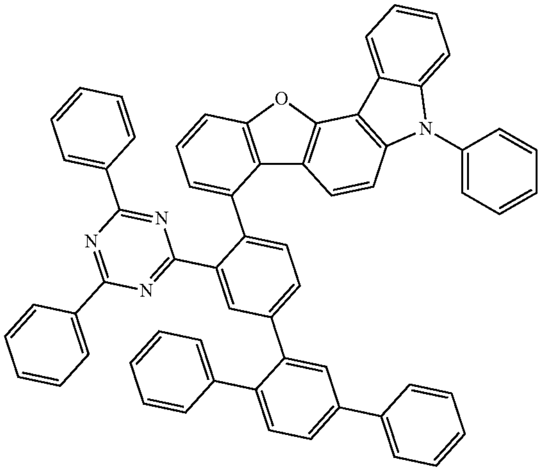
858
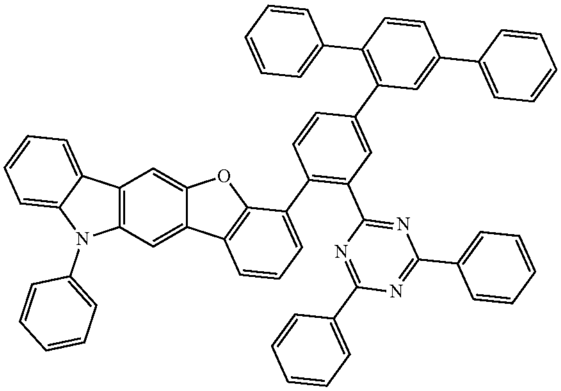
859
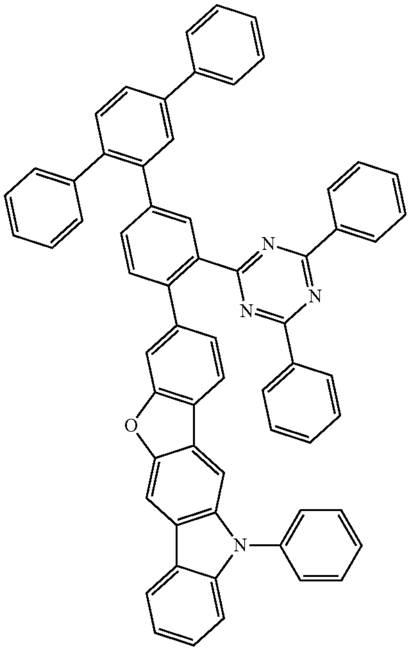
-continued
860
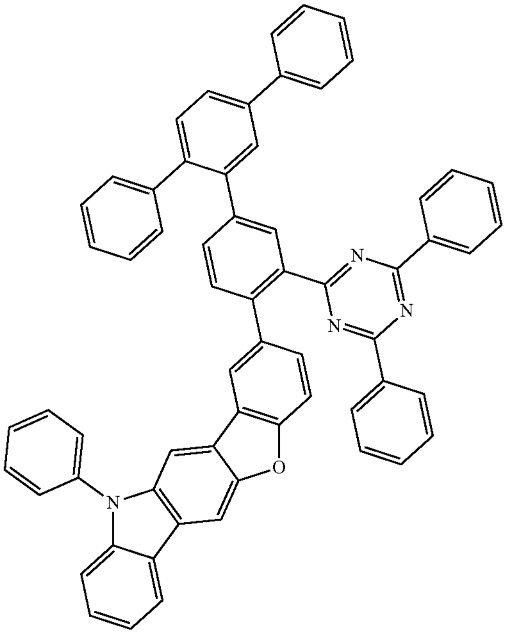
861
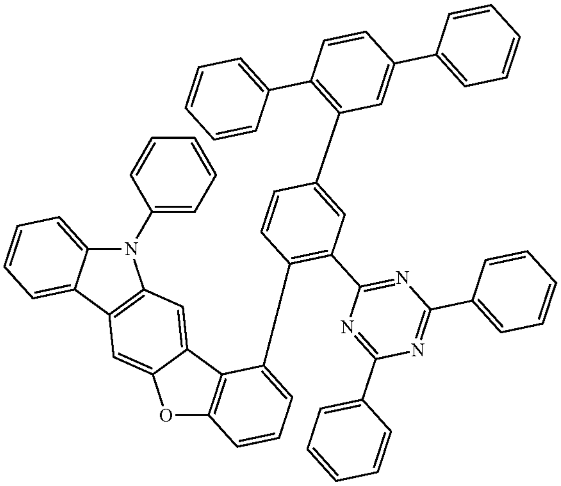
862
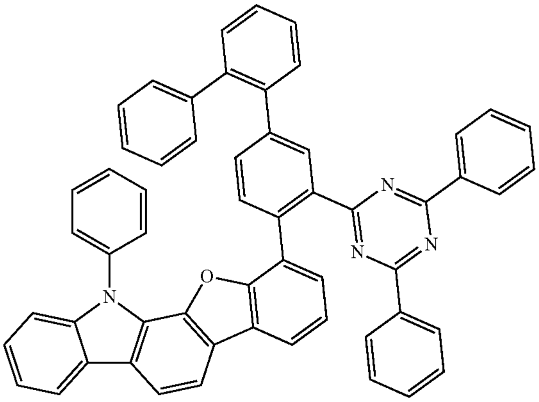

-continued
863
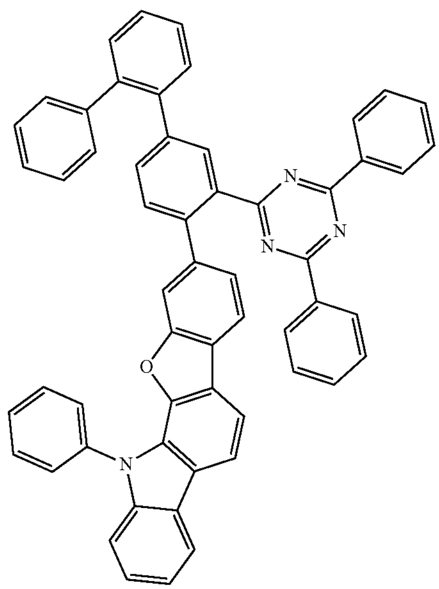
864
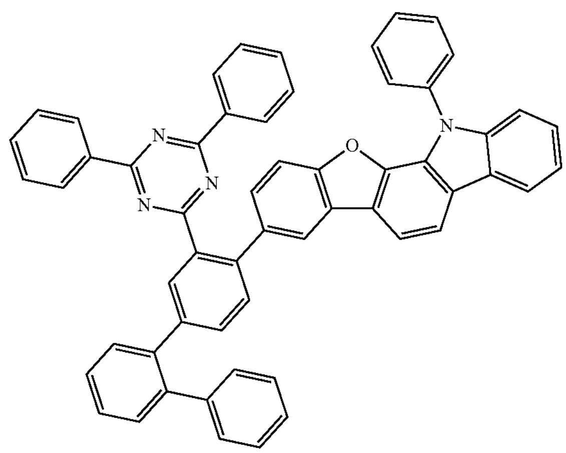
865
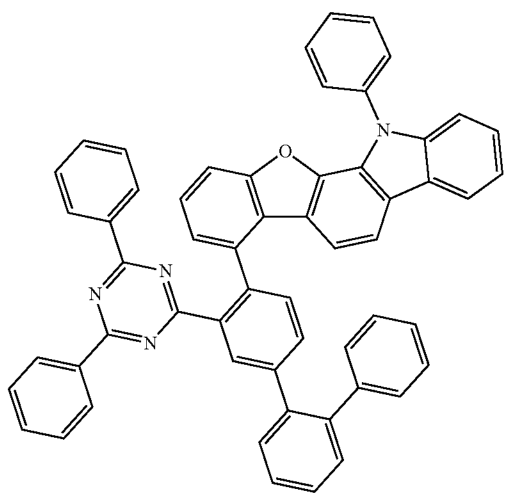
-continued
866
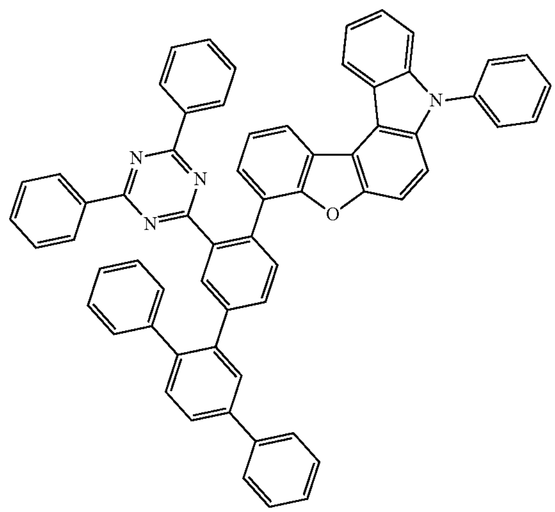
867
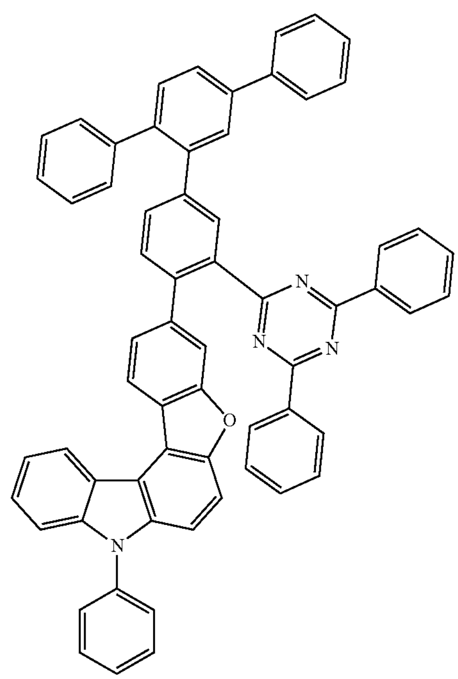

-continued
868
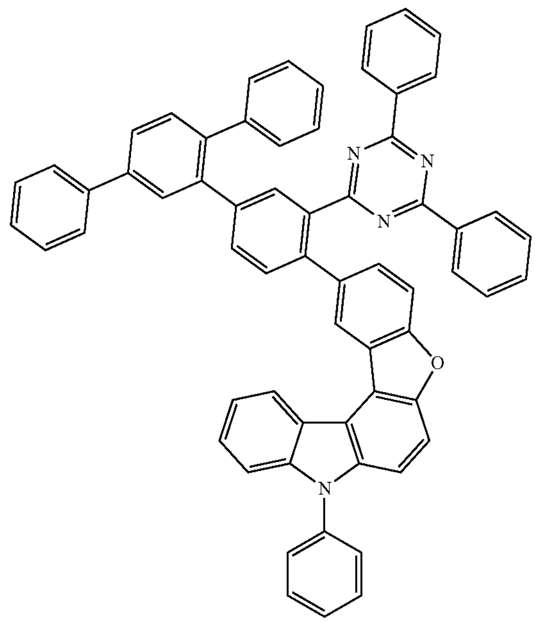
869
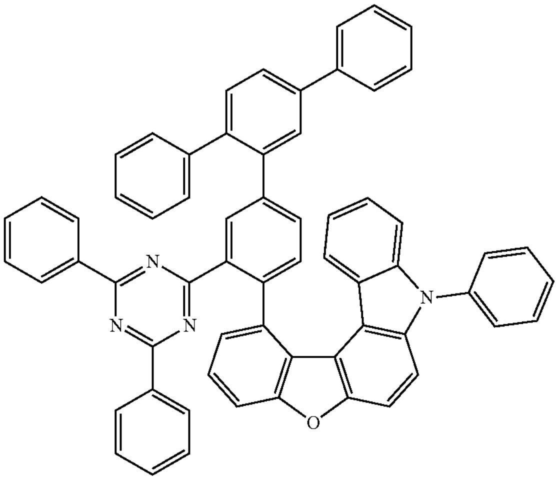
870
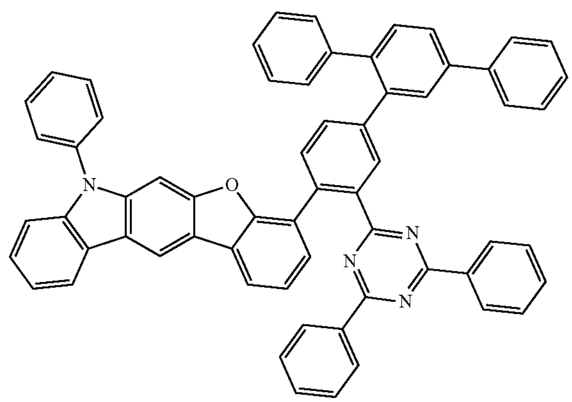
-continued
871
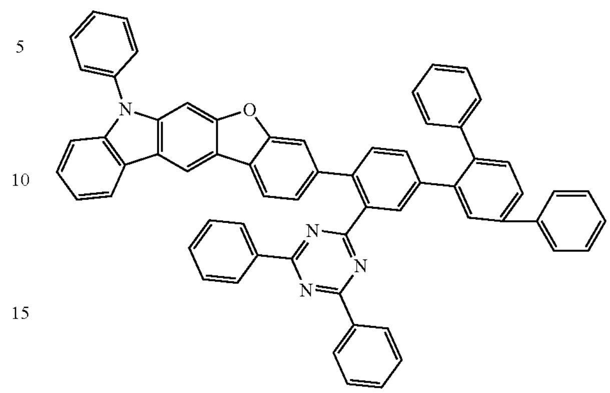
872
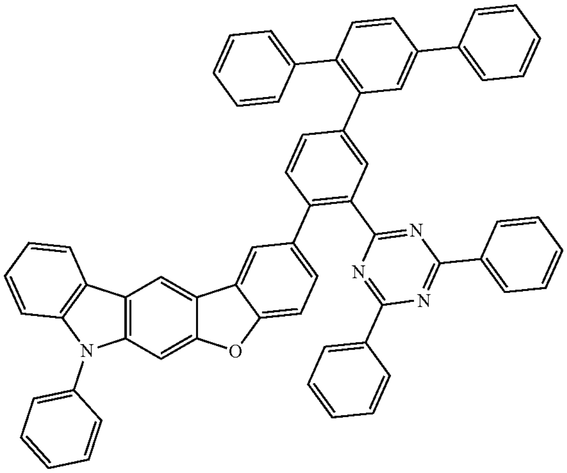
873
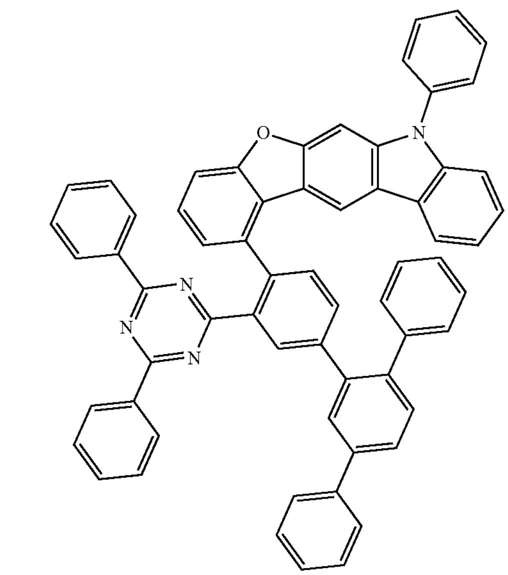

-continued
874
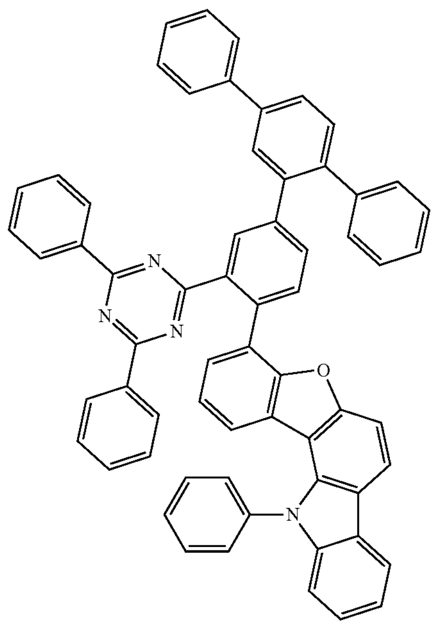
875
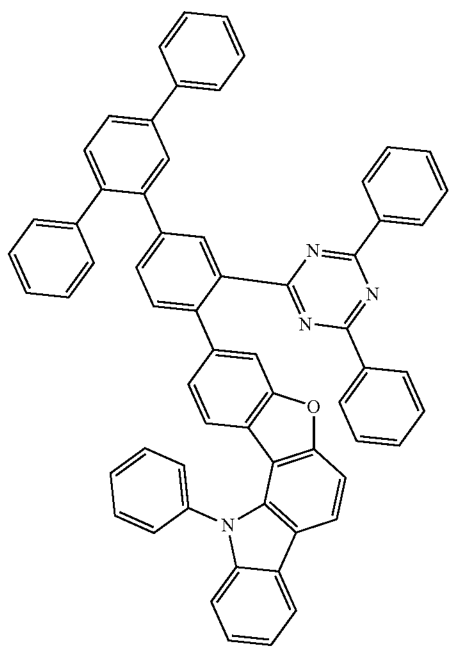
-continued
876
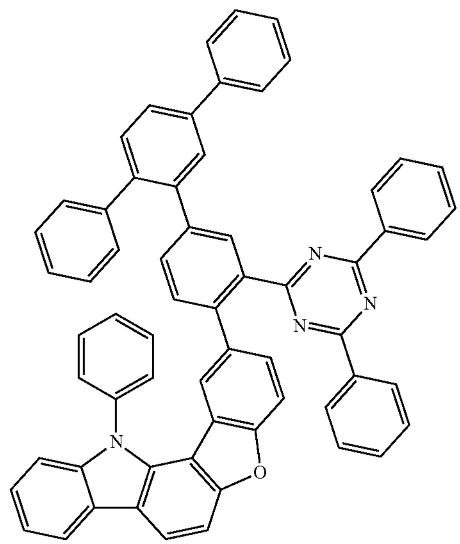
877
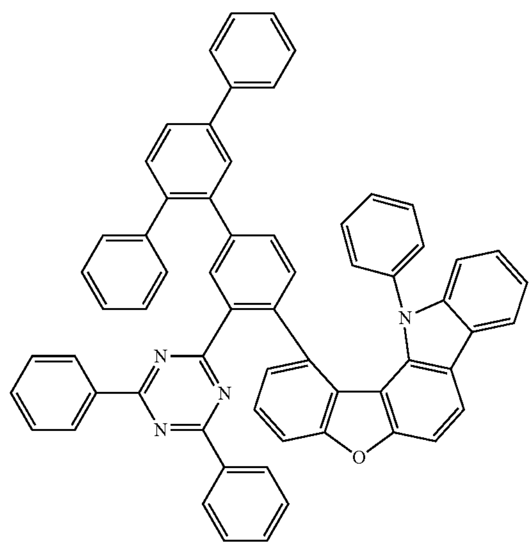
878
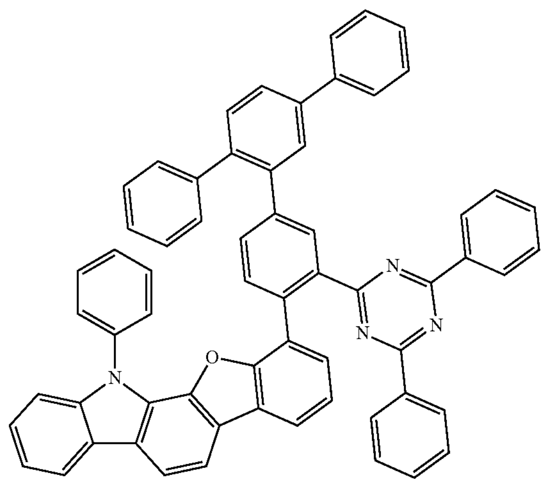

-continued
879
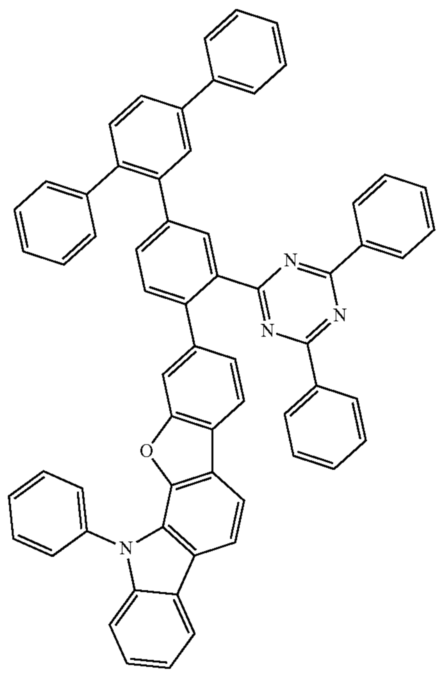
880
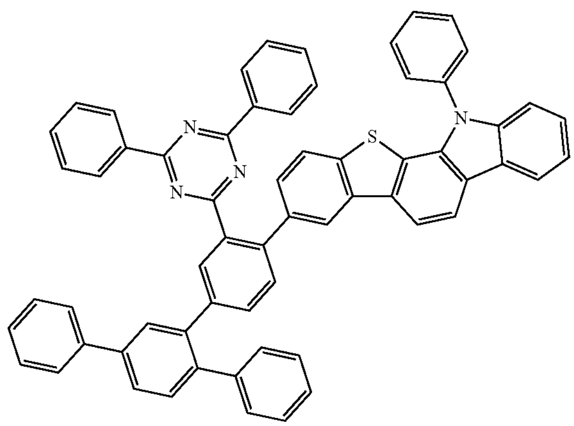
-continued
881
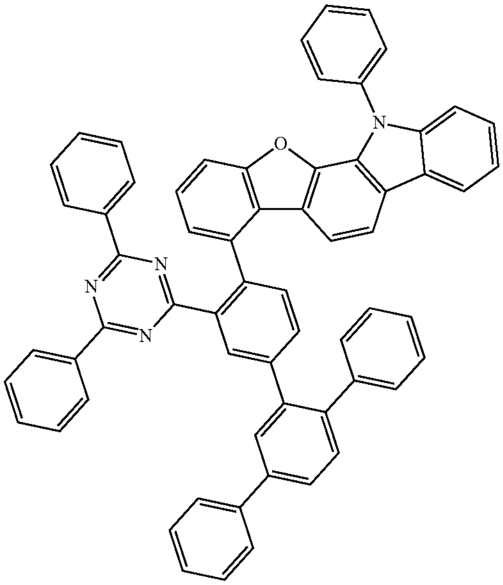
882
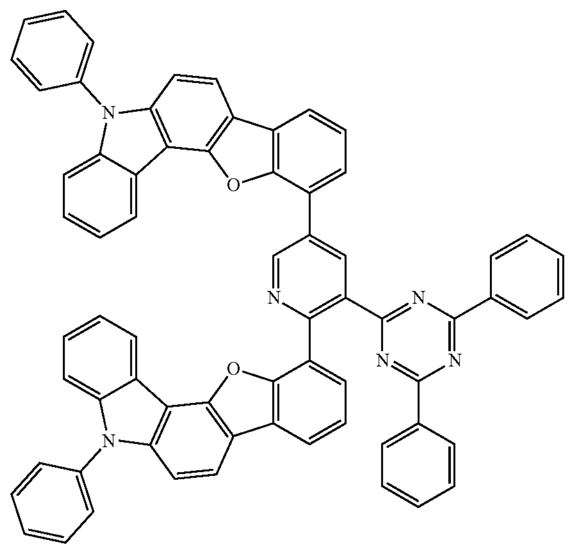

-continued
883
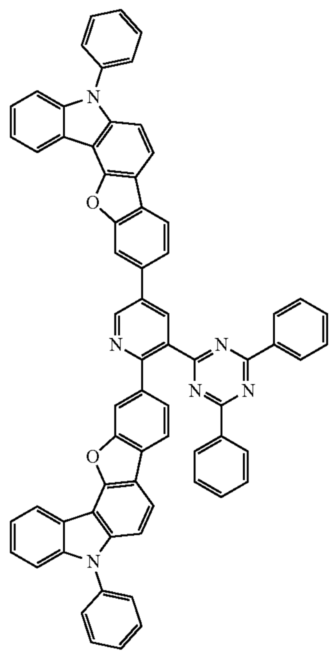
884
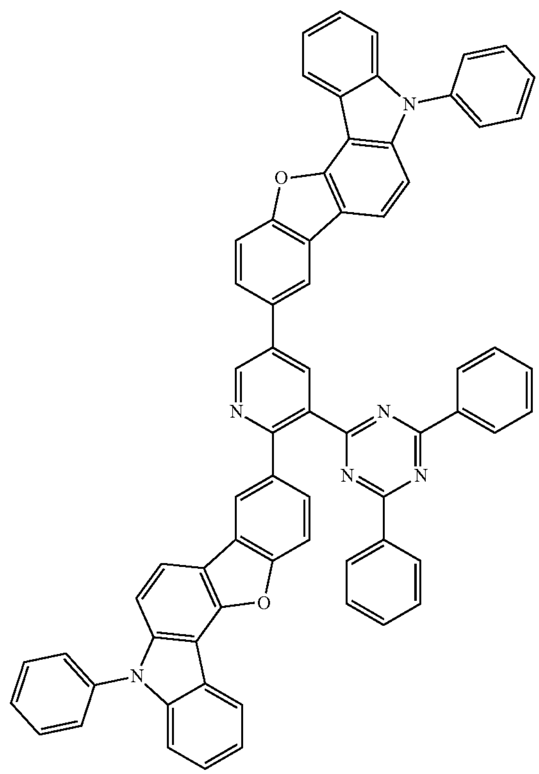
-continued
885
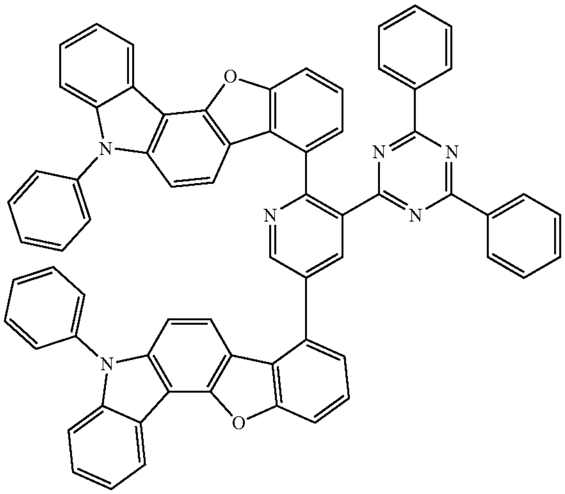
886
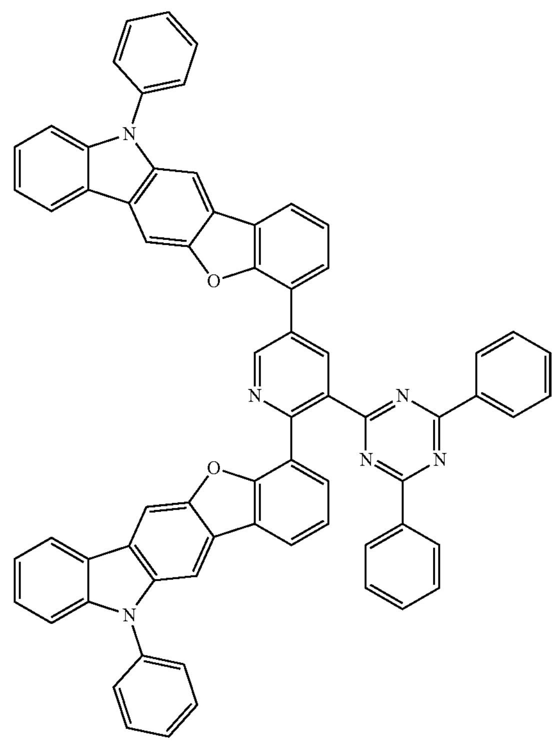

-continued
887
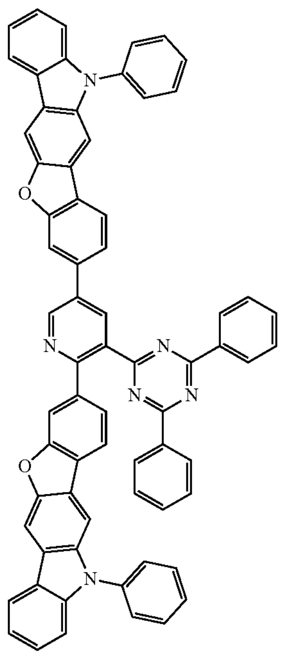
888
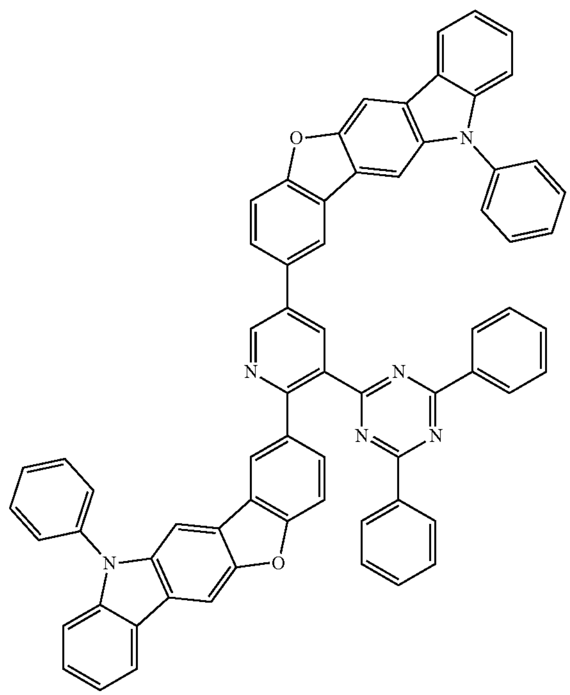
-continued
889
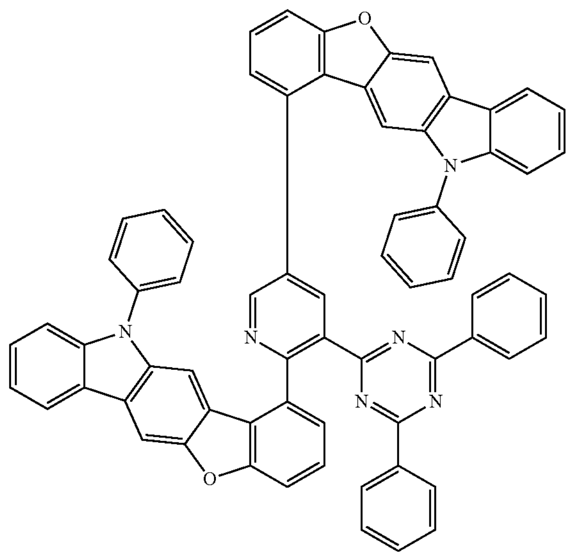
890
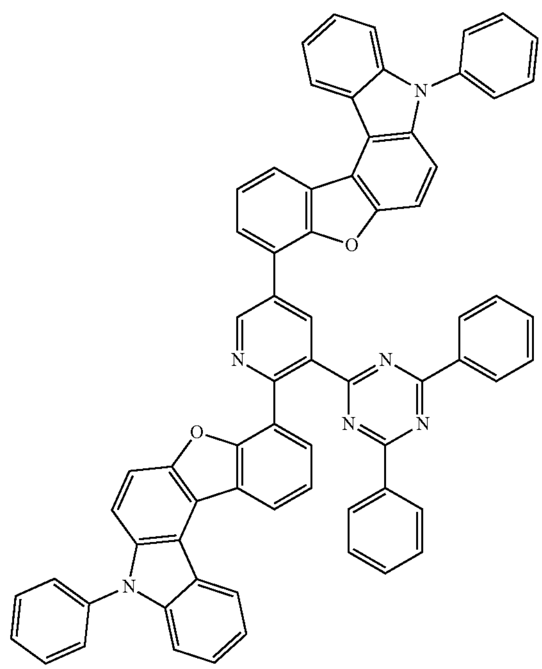

891
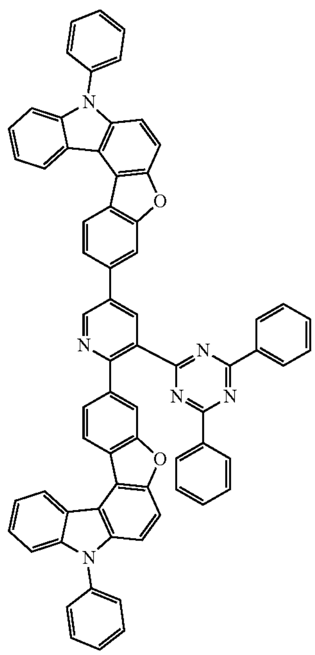
892
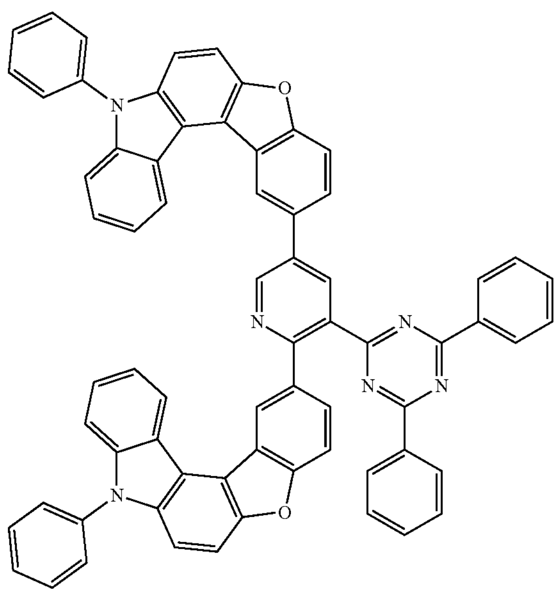
893
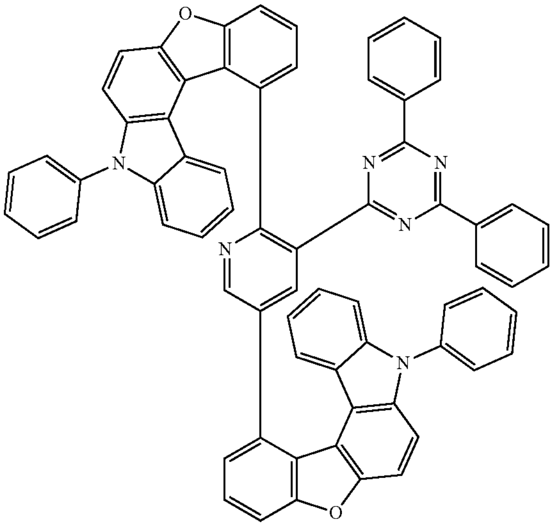
894
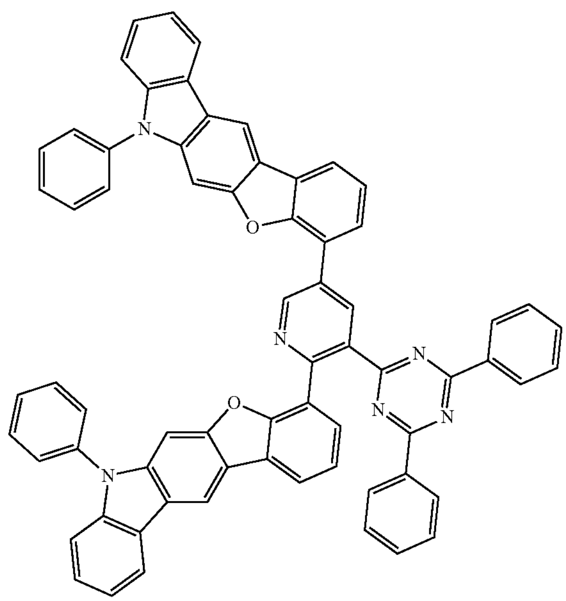

-continued
895
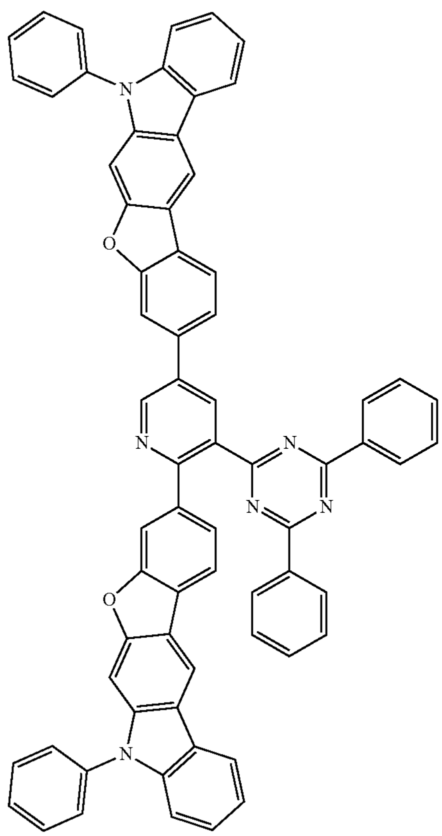
896
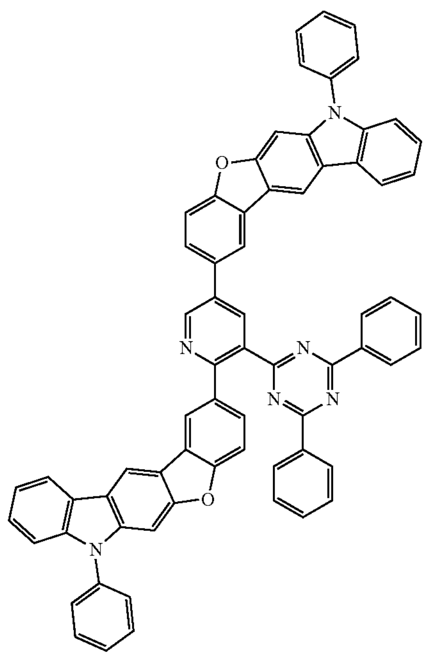
-continued
897
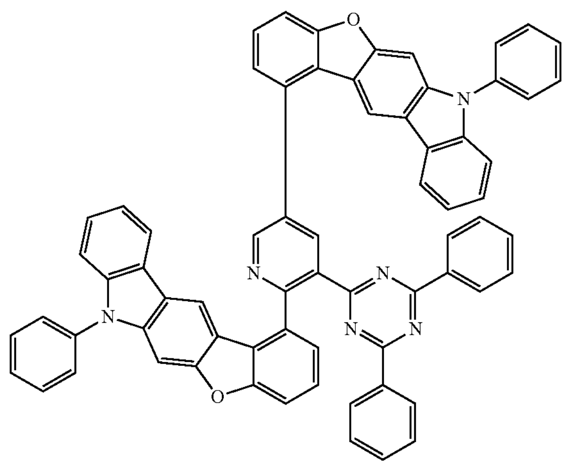
898
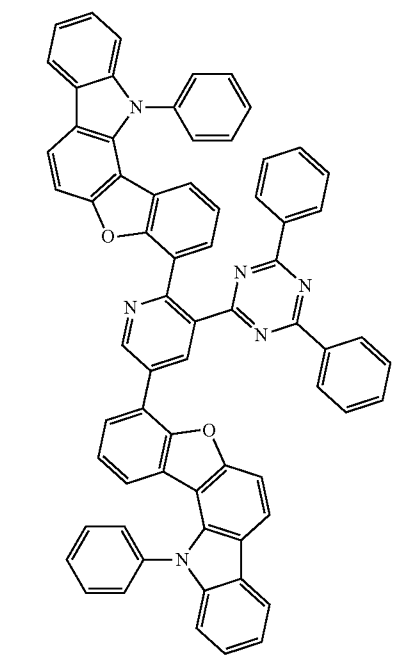

-continued
899
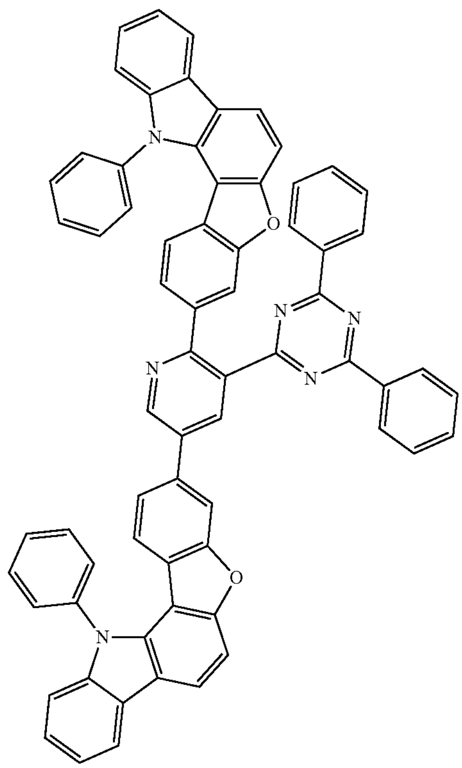
900
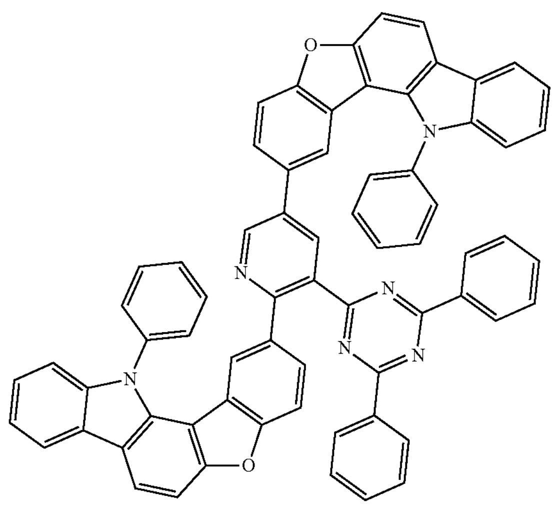
-continued
901
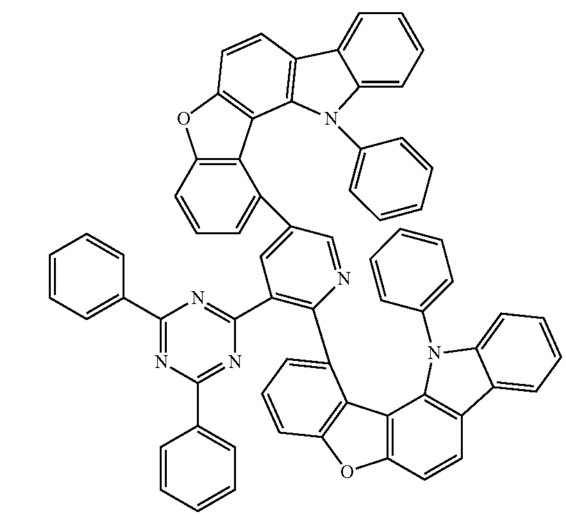
902
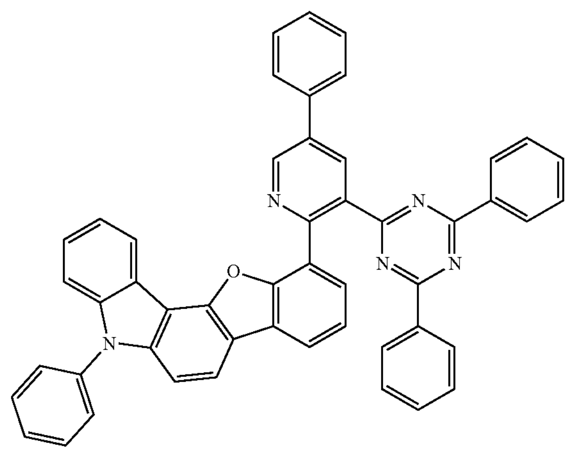
903
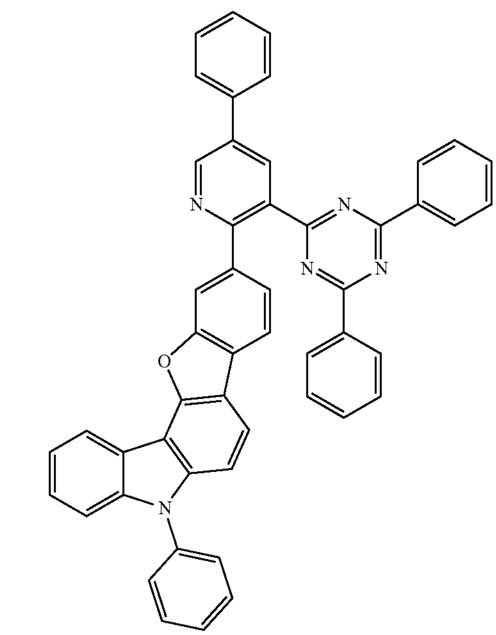

-continued
904
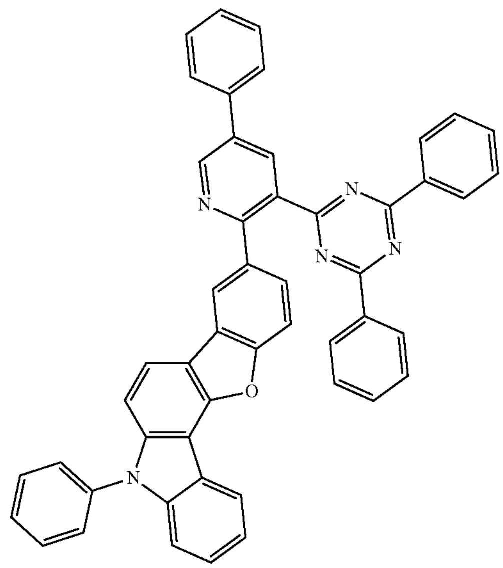
905
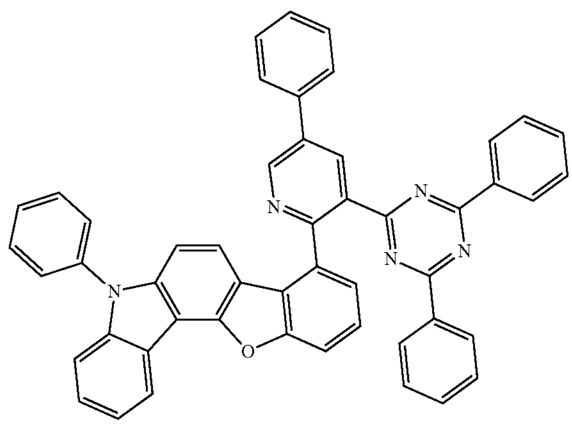
906
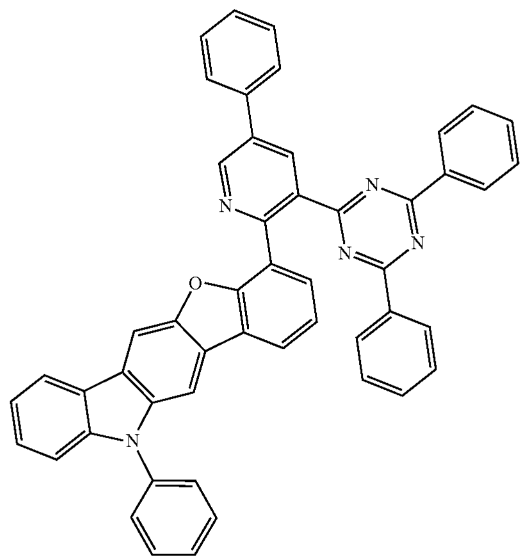
-continued
907
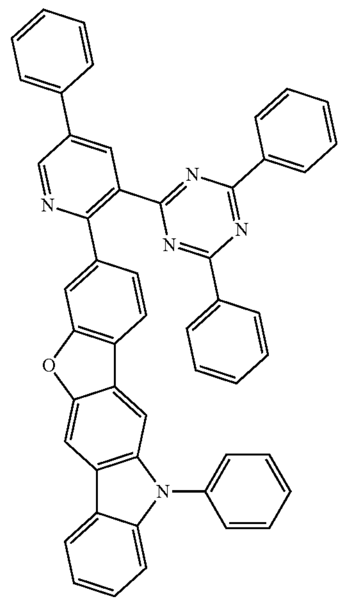
908
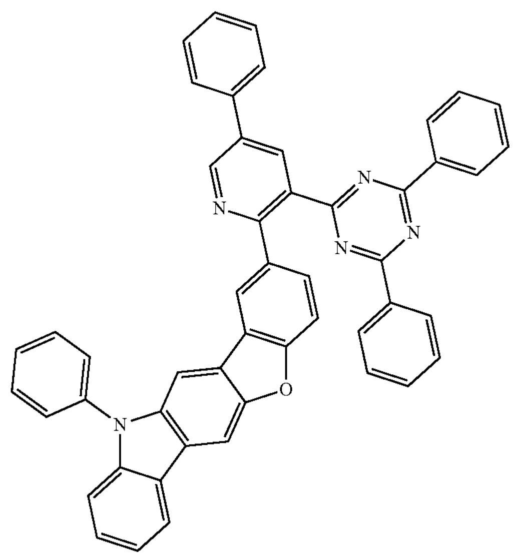
909
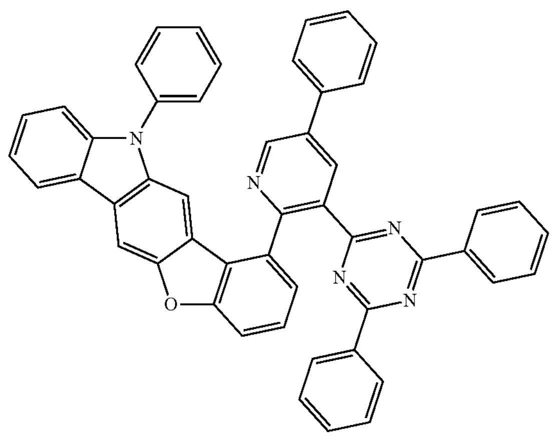

-continued
910
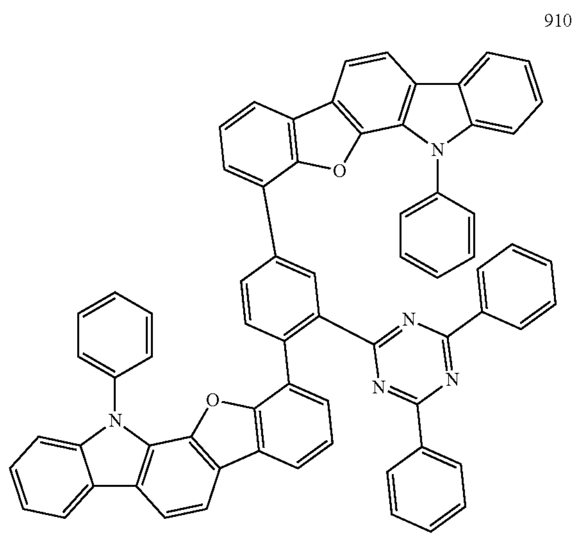
911
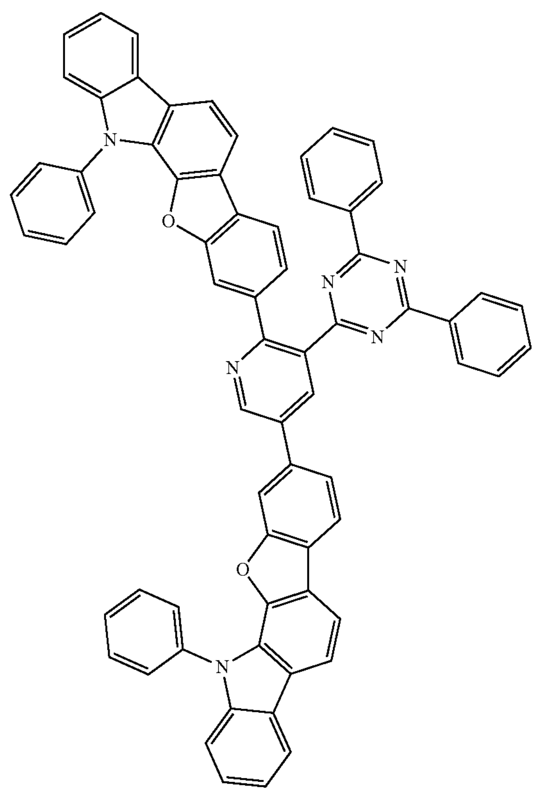
-continued
912
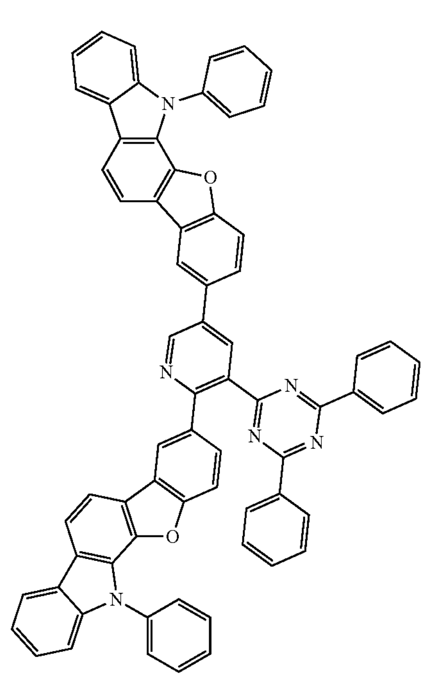
913
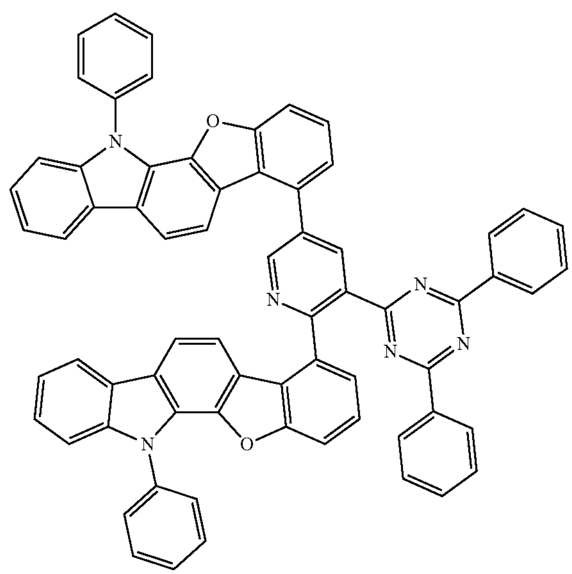

-continued
914
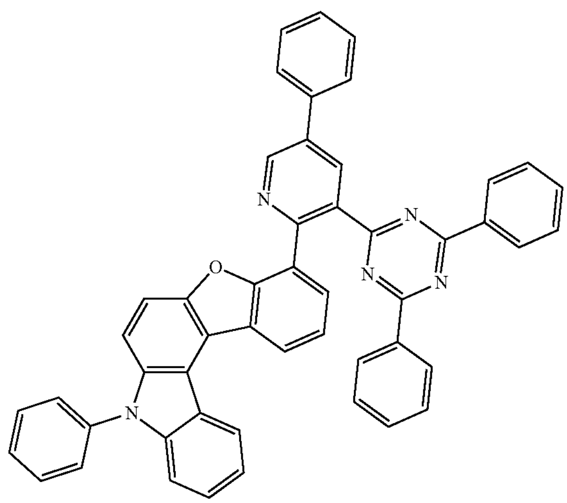
915
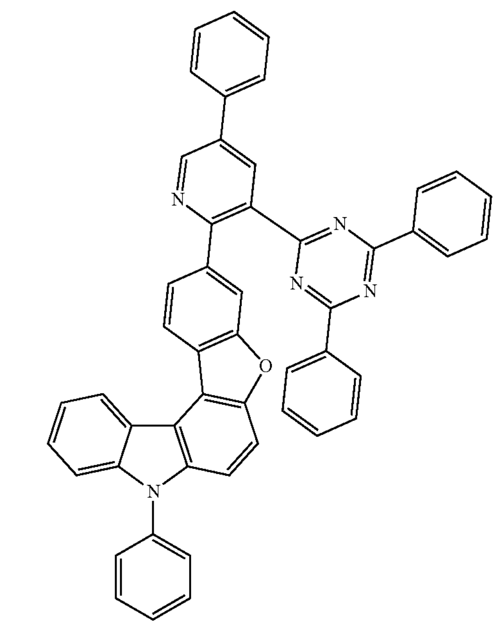
916
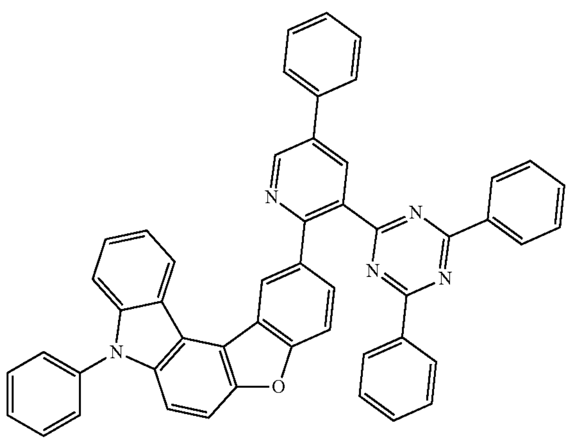
-continued
917
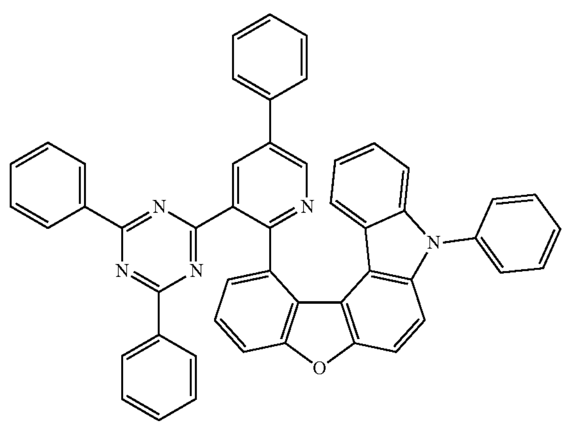
918
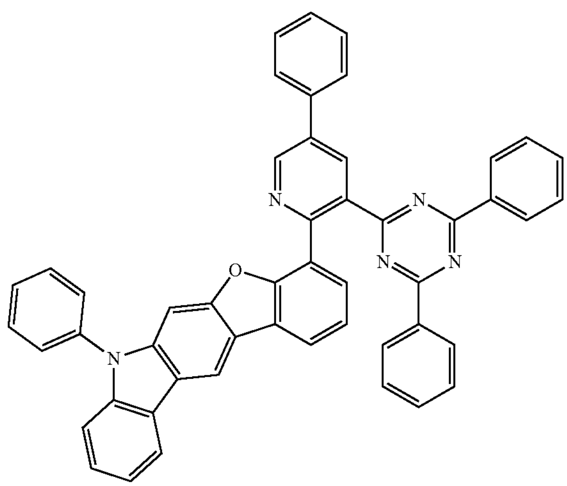
919
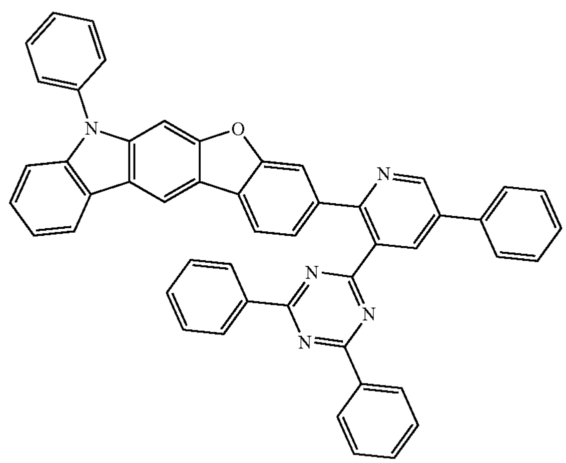

-continued
920
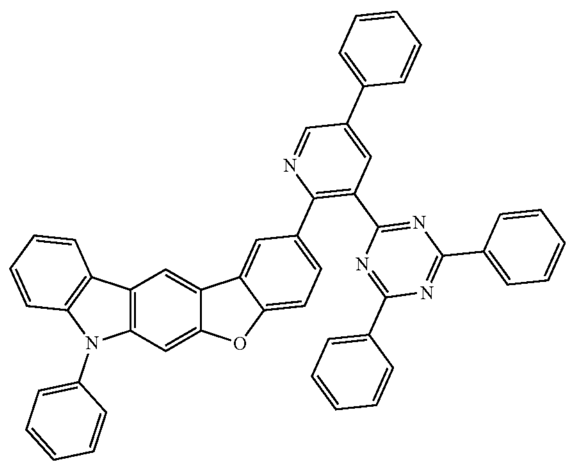
921
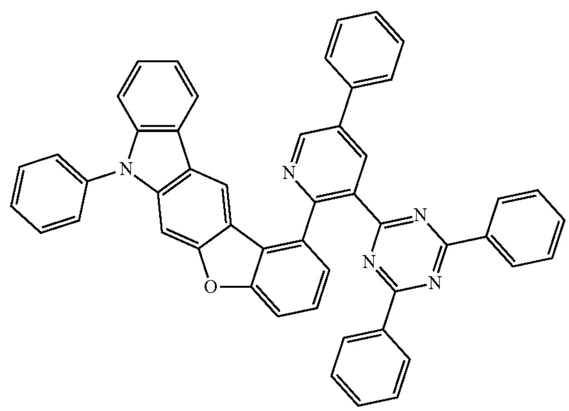
922
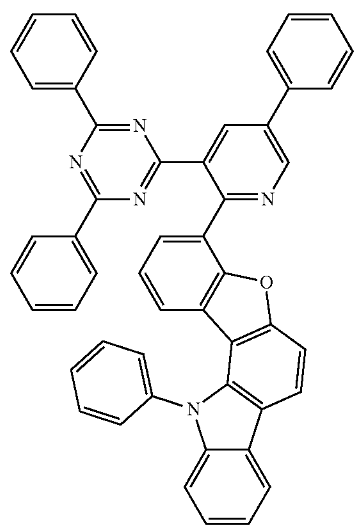
-continued
923
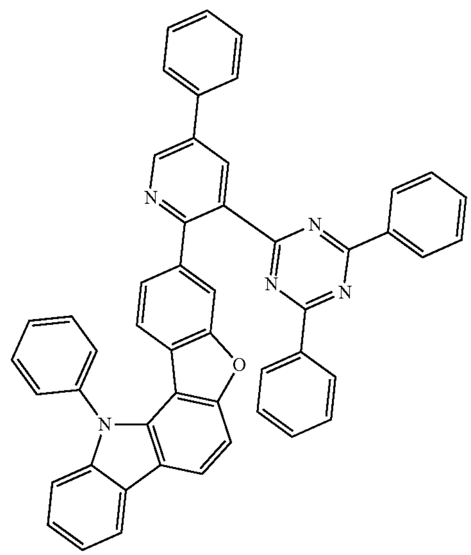
924
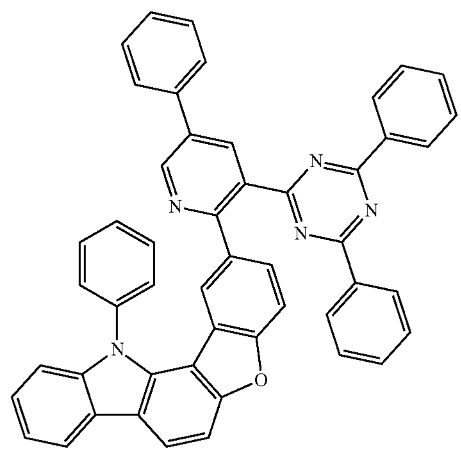
925
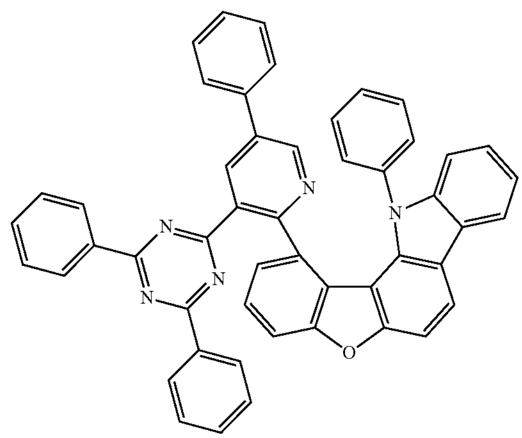

-continued
926
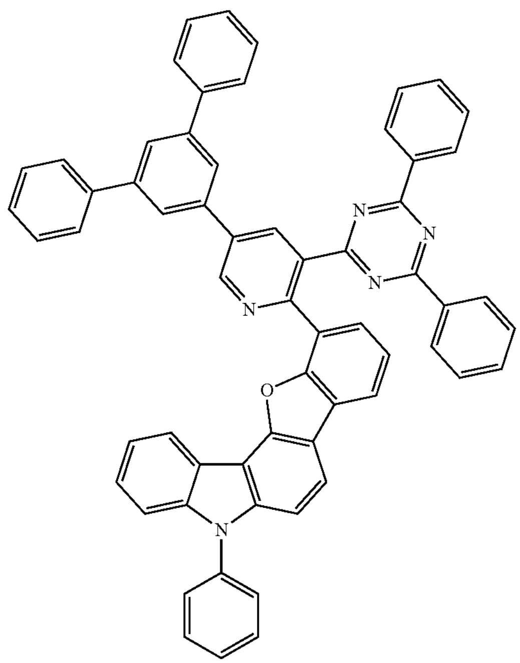
927
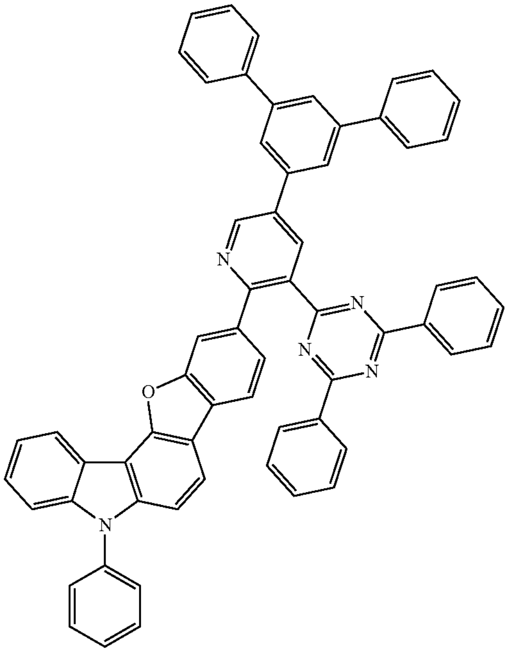
-continued
928
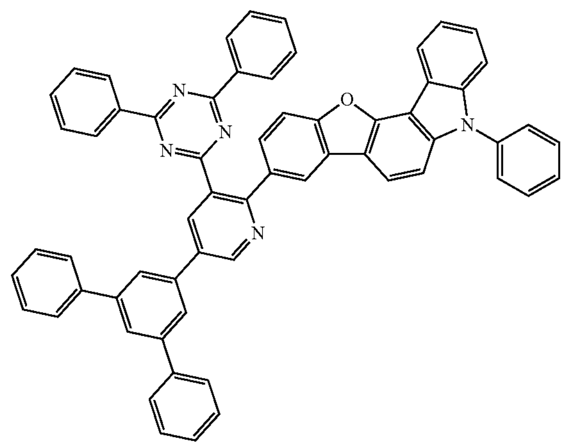
929
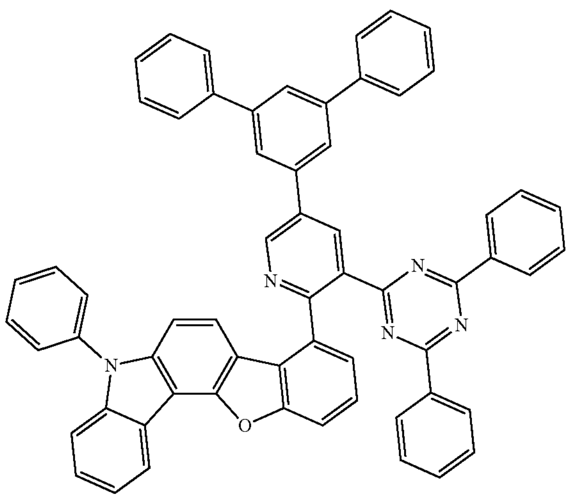
930
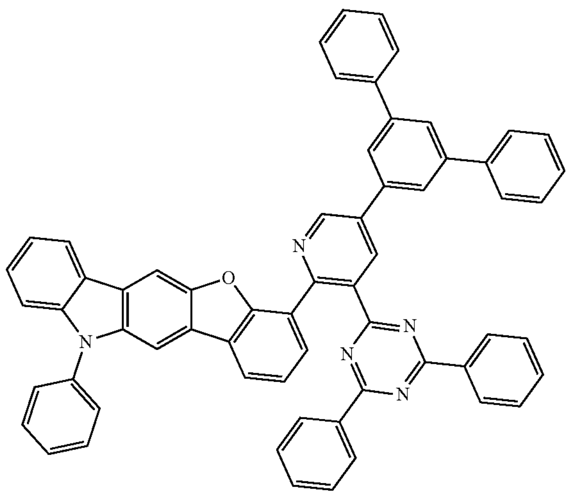

-continued
931
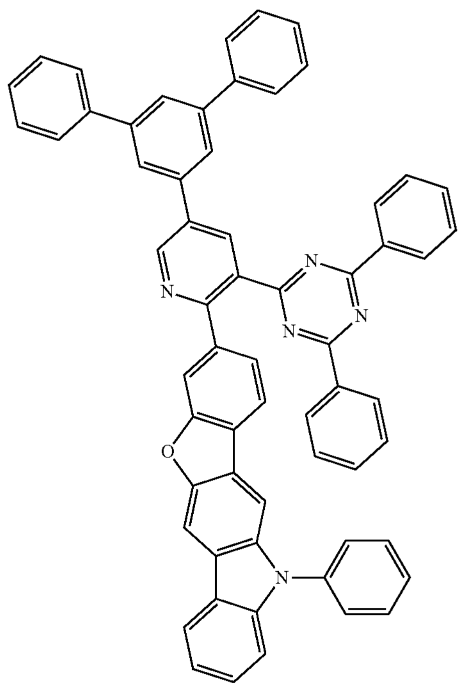
932
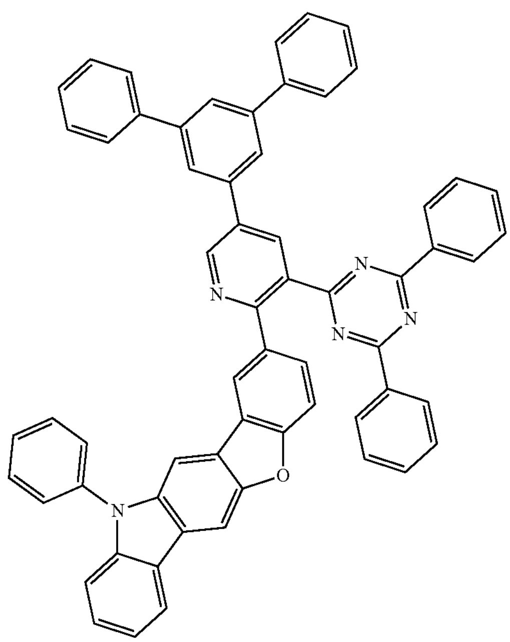
-continued
933
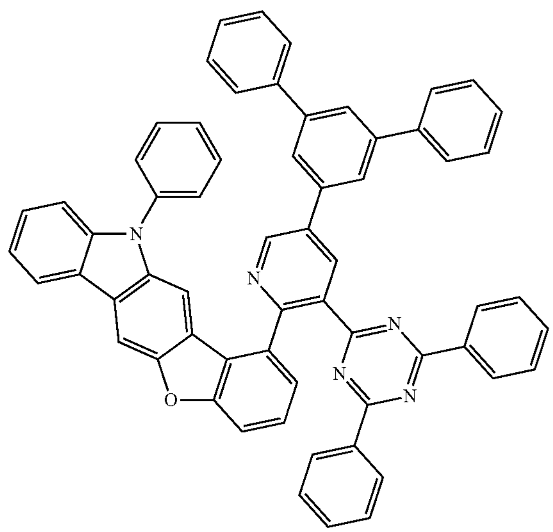
934
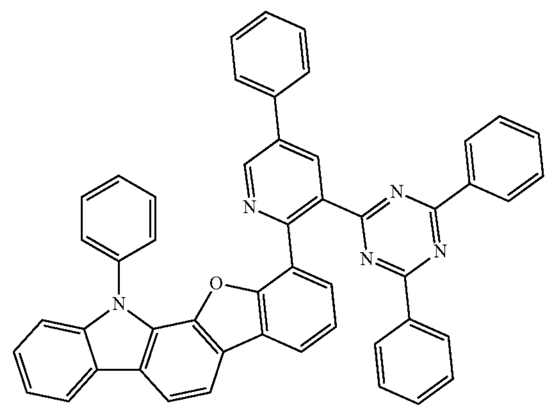
935
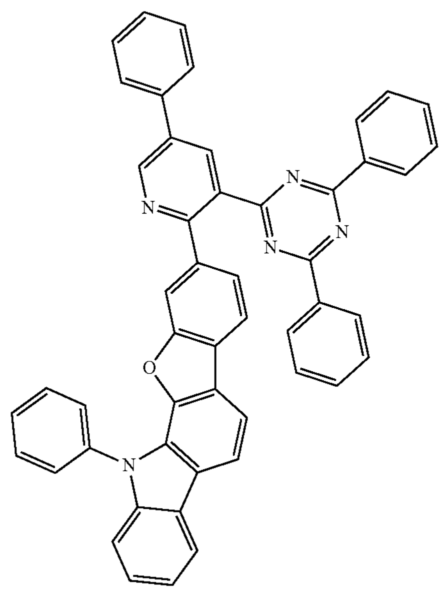

-continued
936
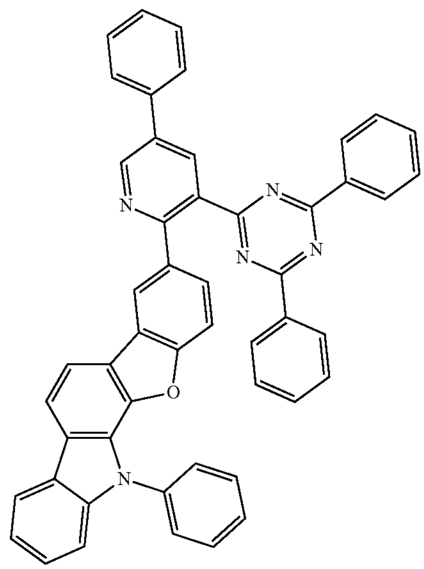
937
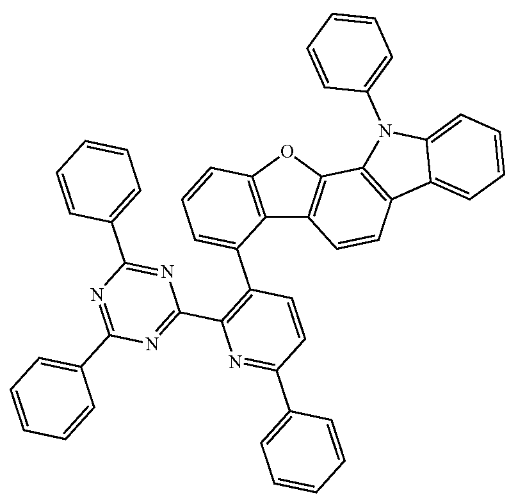
938
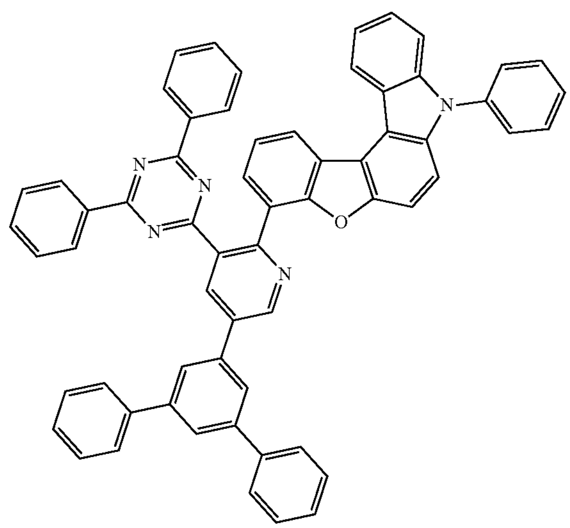
-continued
939
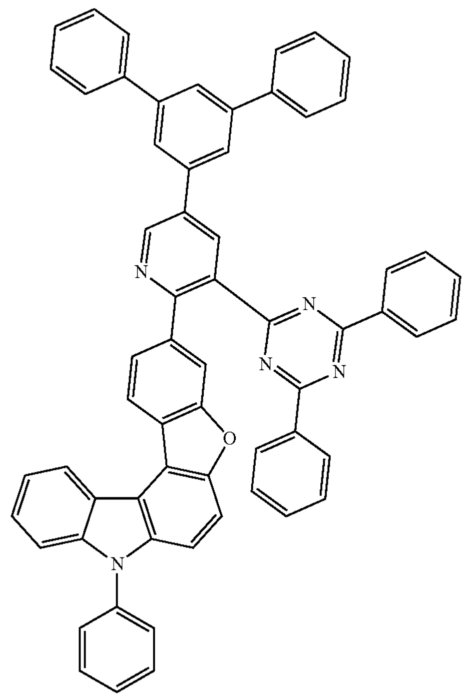
940
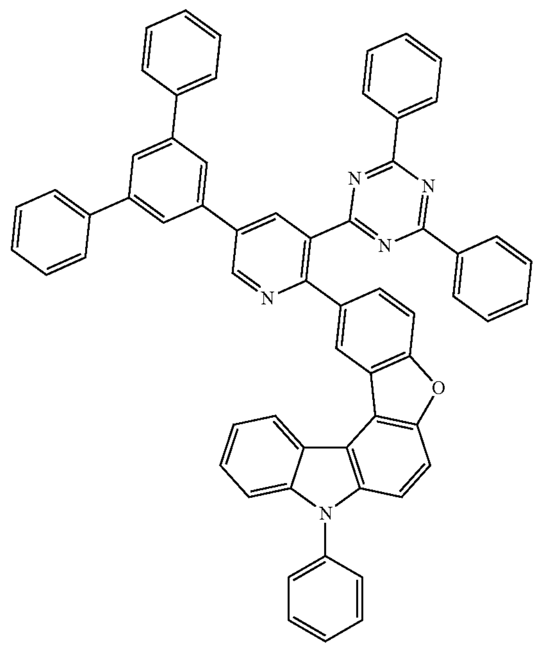

-continued
941
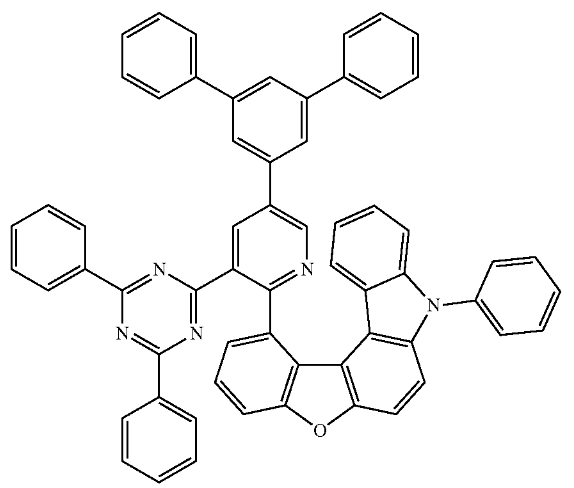
942
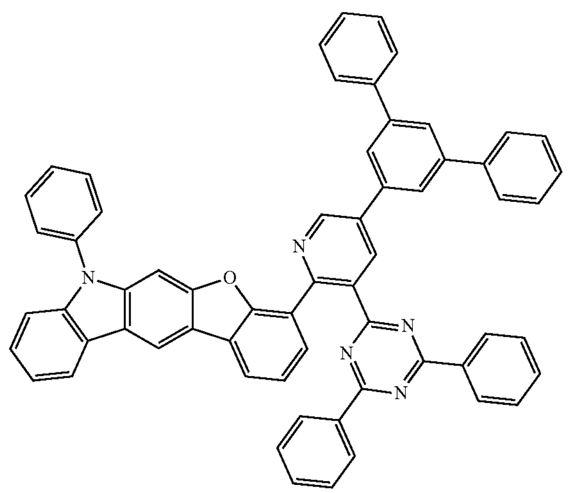
943
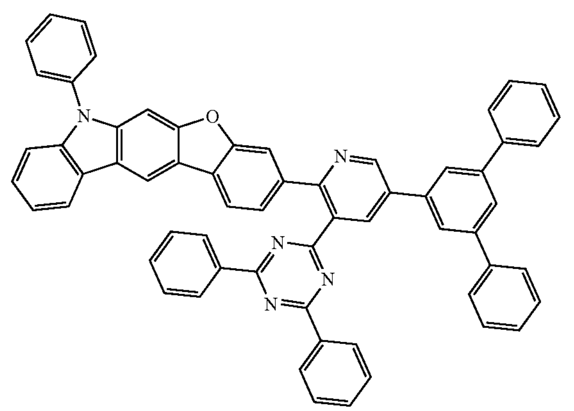
-continued
944
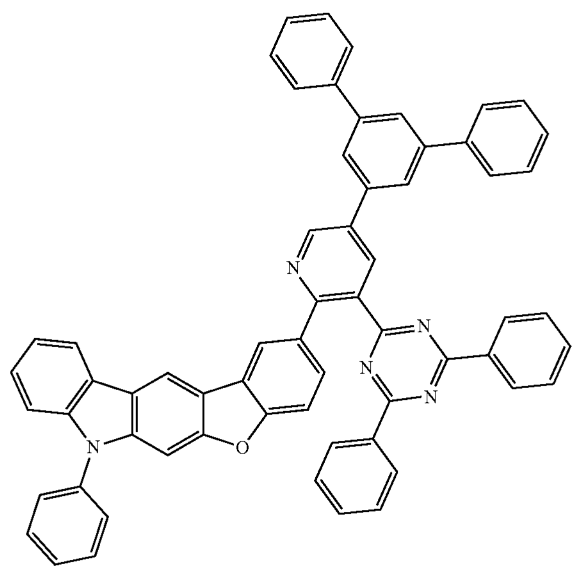
945
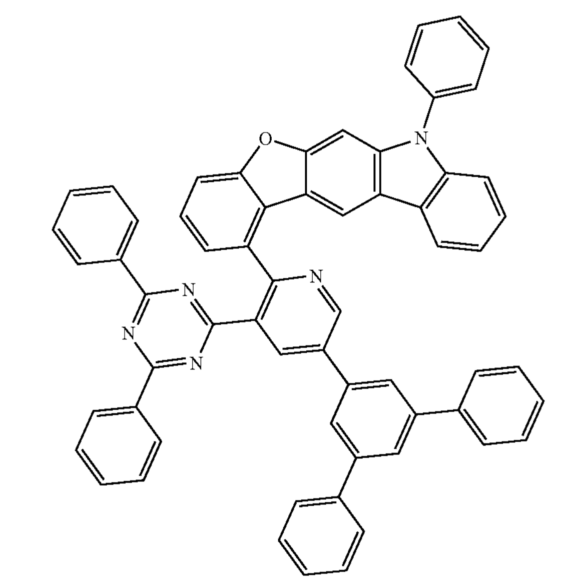

-continued
946
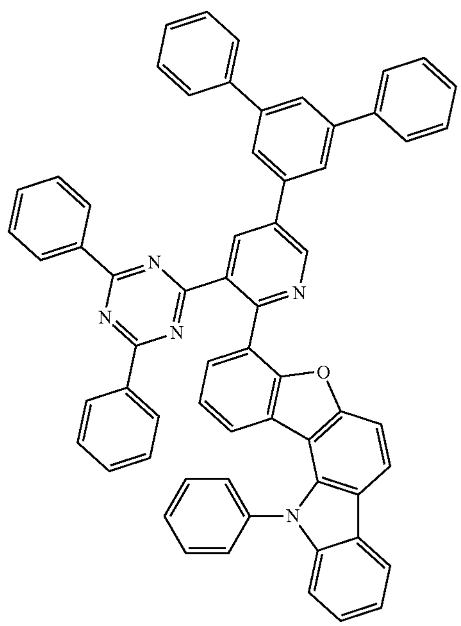
947
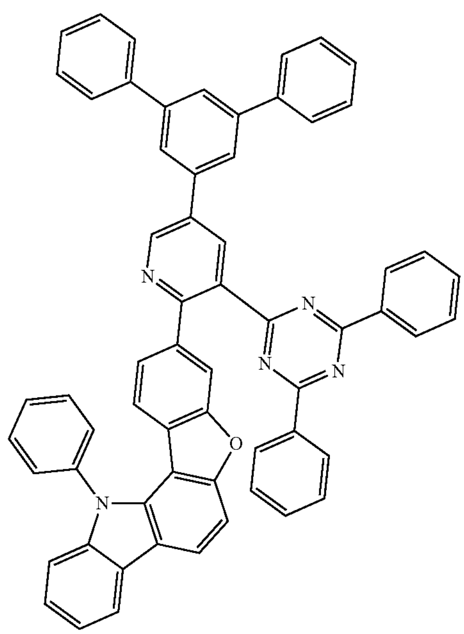
-continued
948
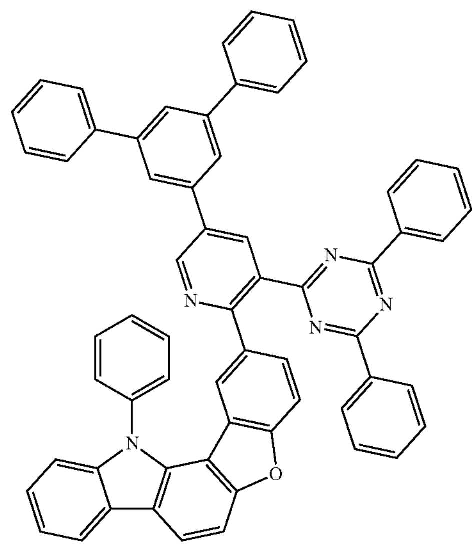
949
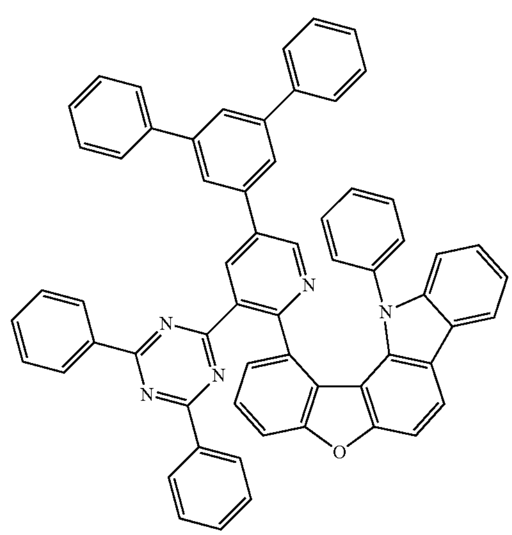

-continued
950
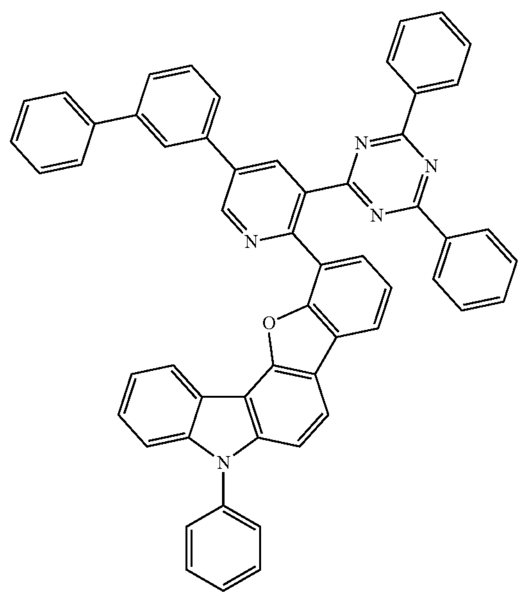
951
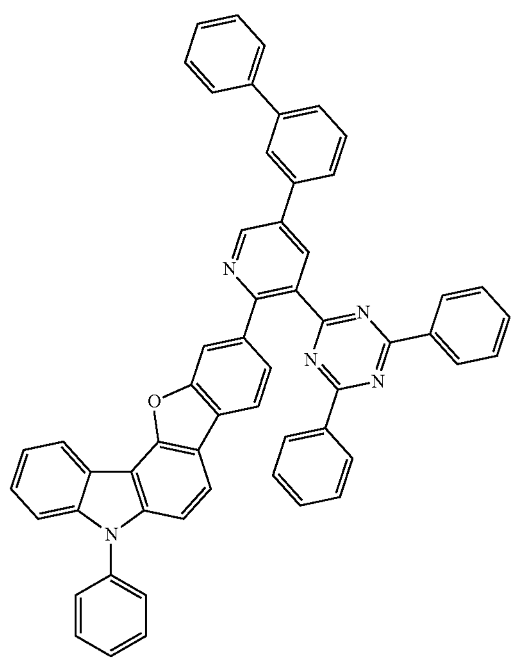
-continued
952
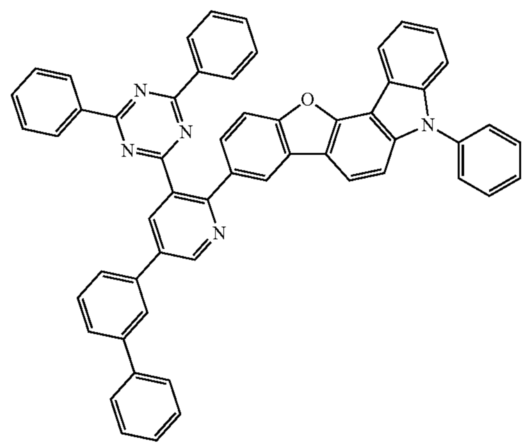
953
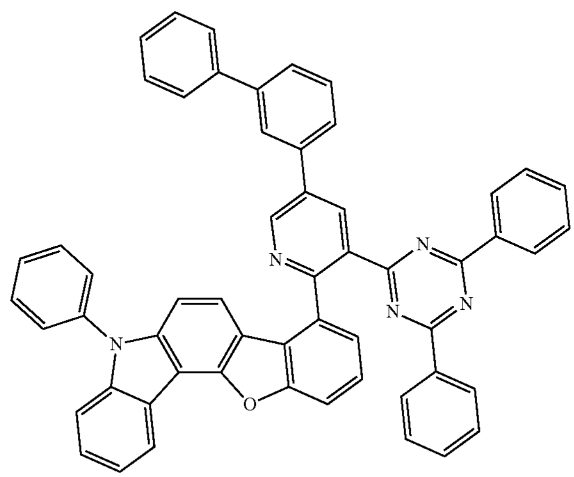
954
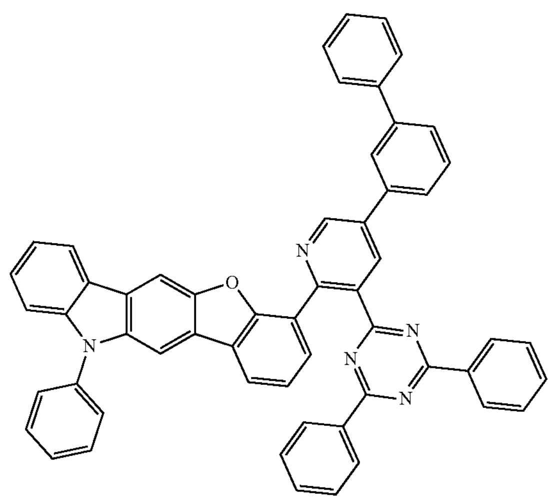

-continued
955
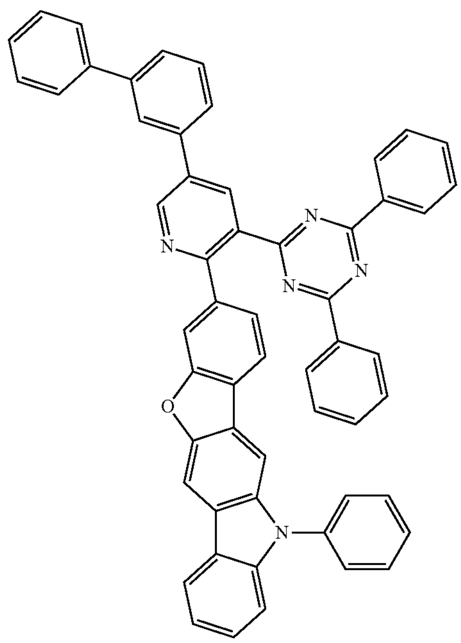
956
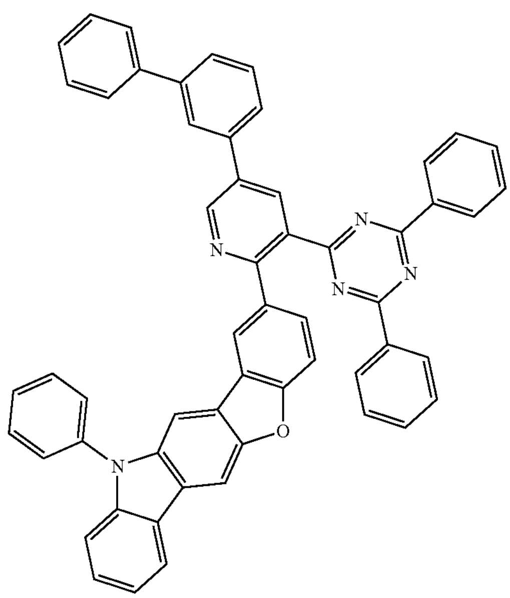
-continued
957
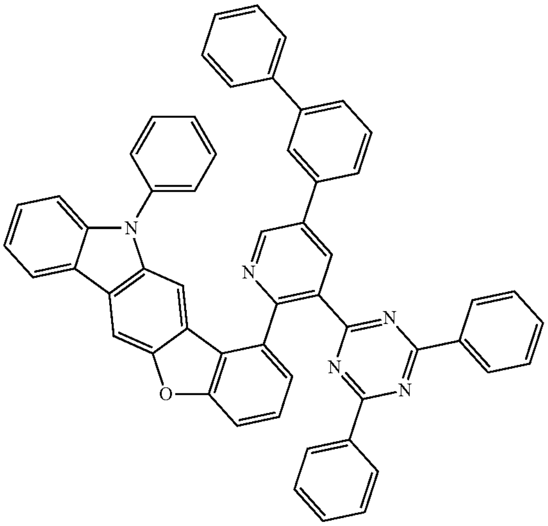
958
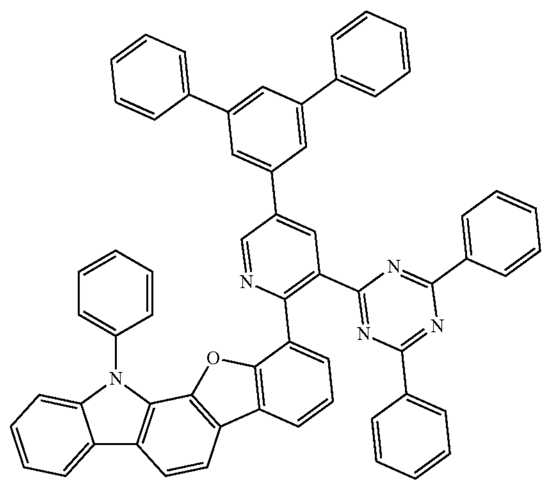

-continued
959
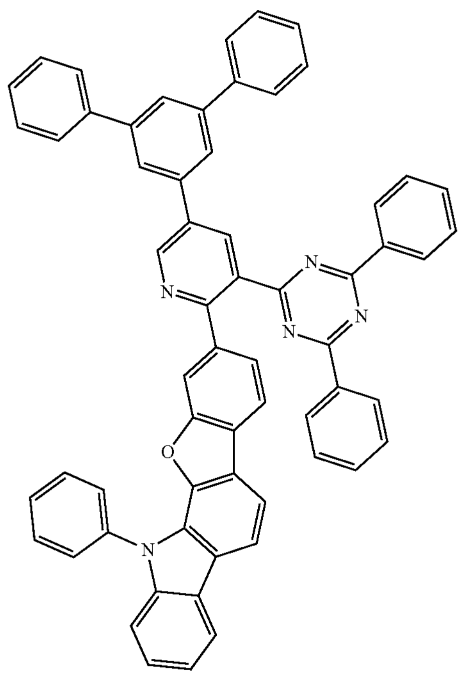
960
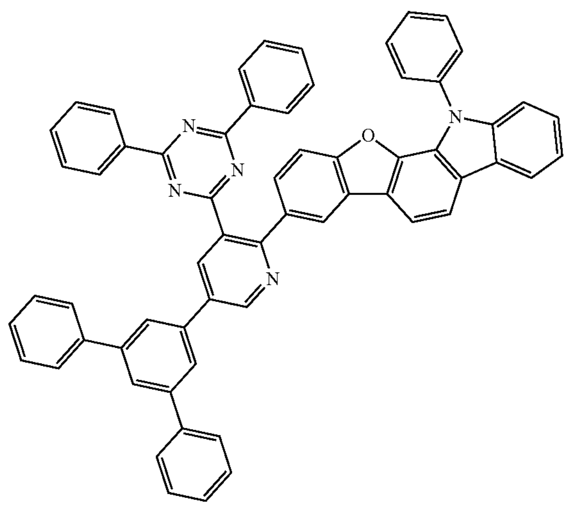
-continued
961
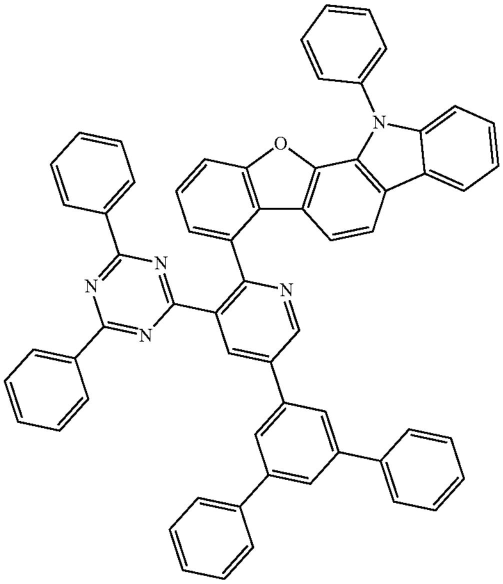
962
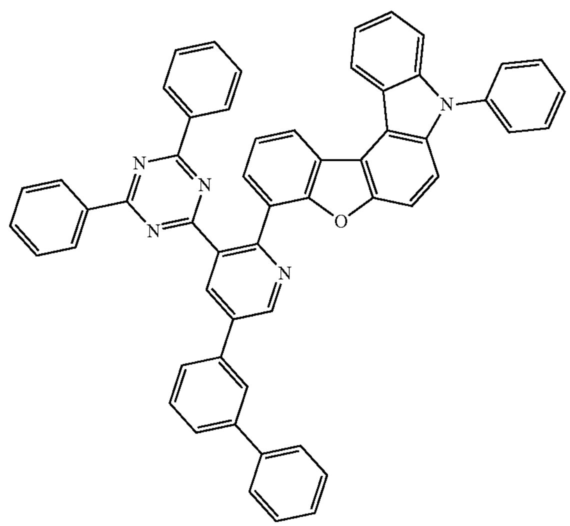

-continued
963
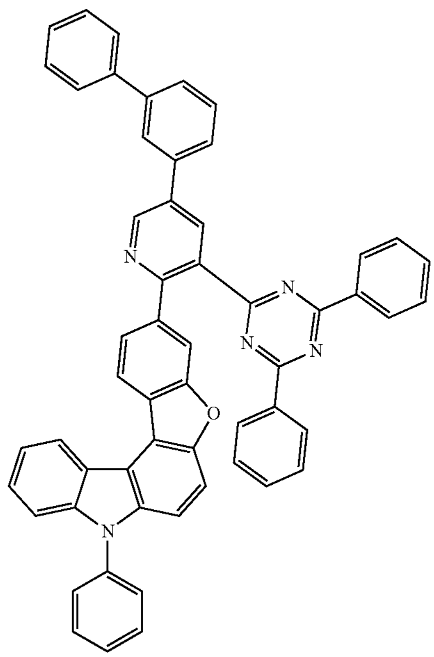
964
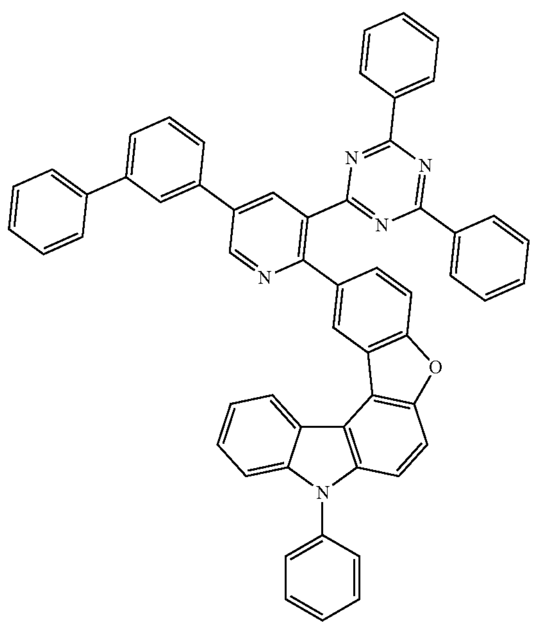
-continued
965
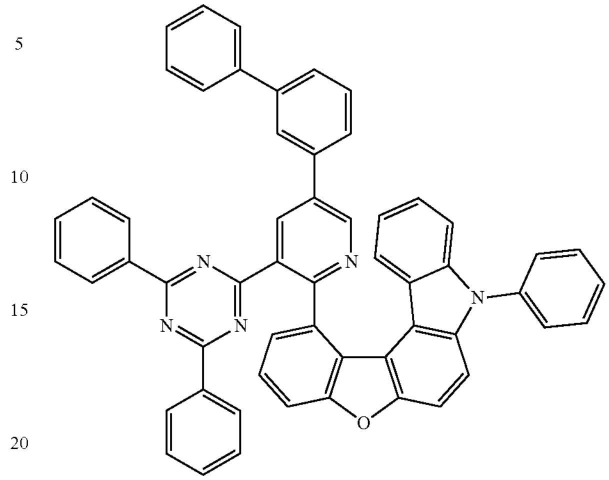
966
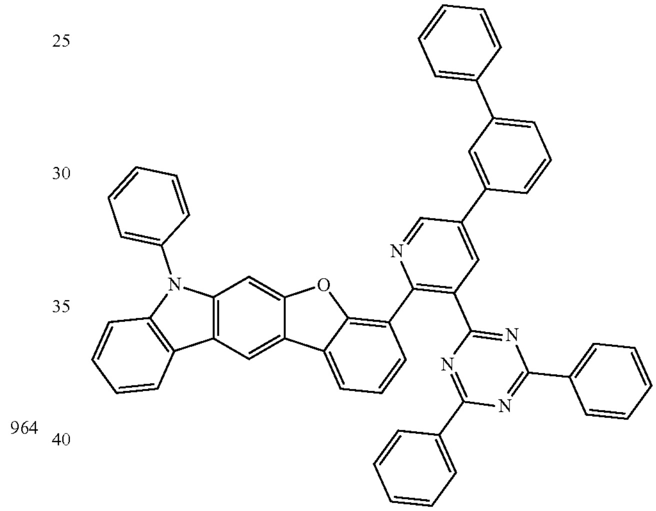
967
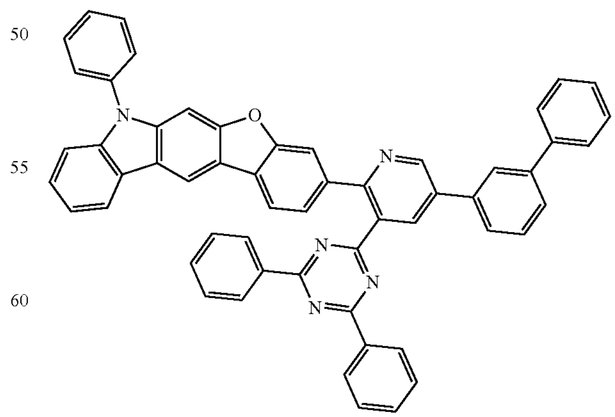

-continued
968
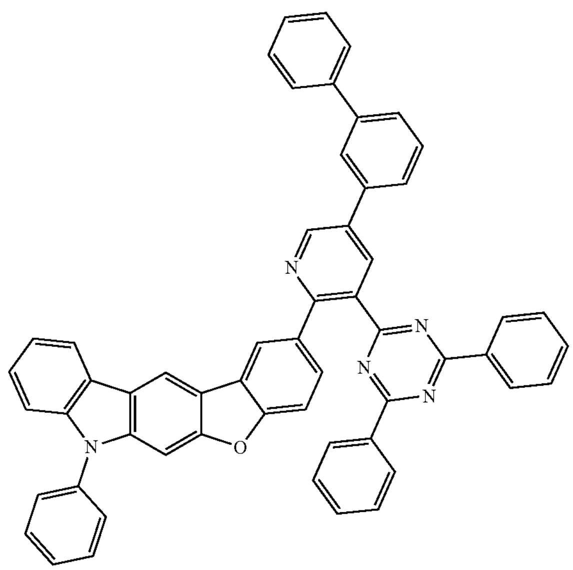
969
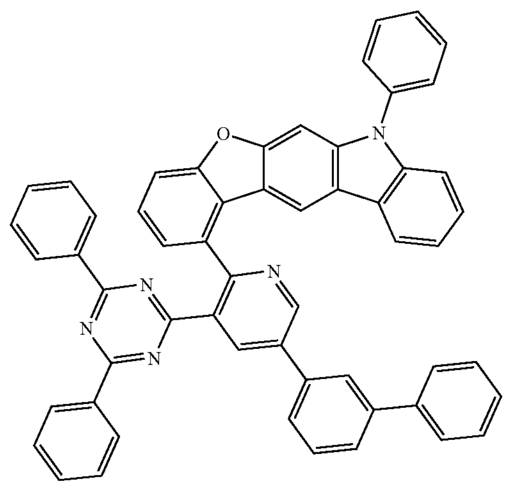
970
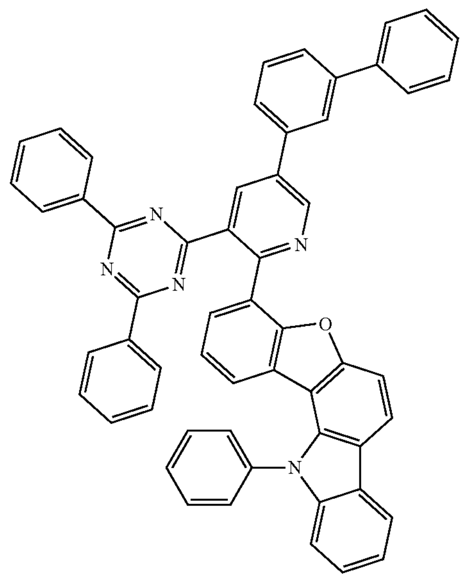
-continued
971
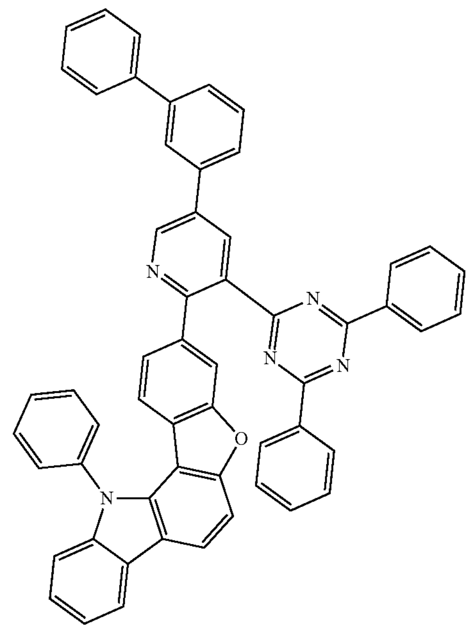
972
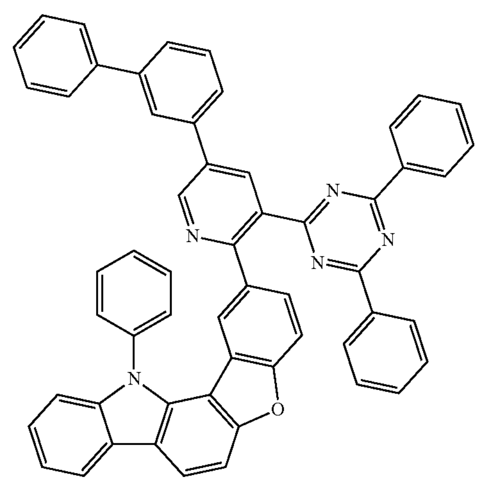
973
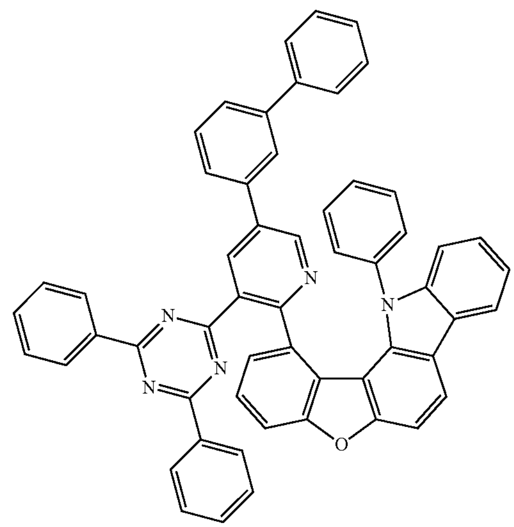

-continued
974
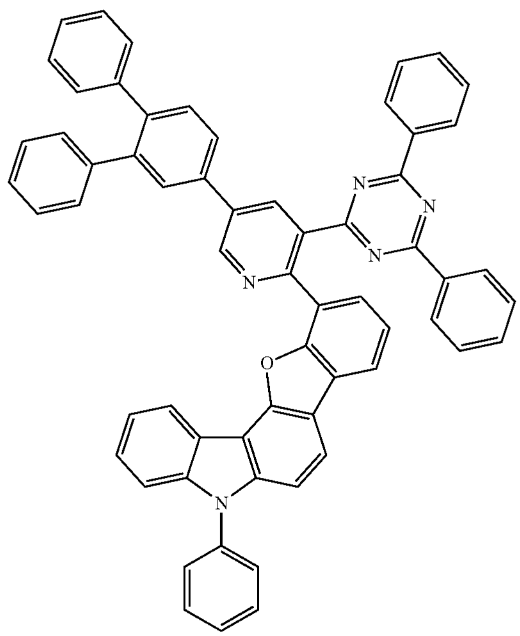
975
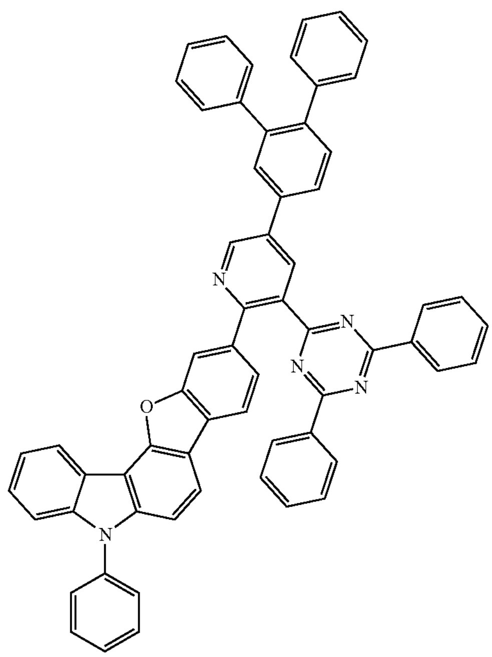
-continued
976
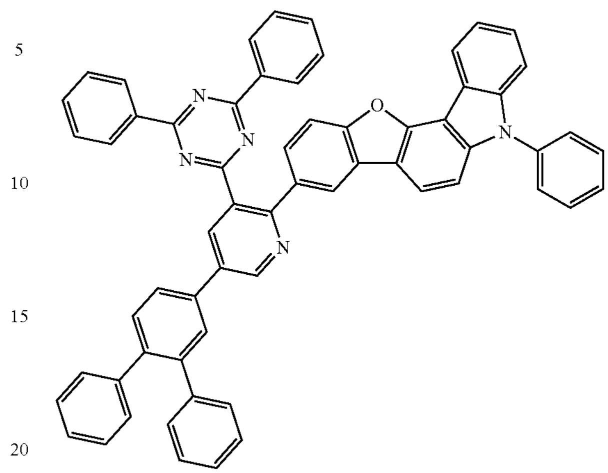
977
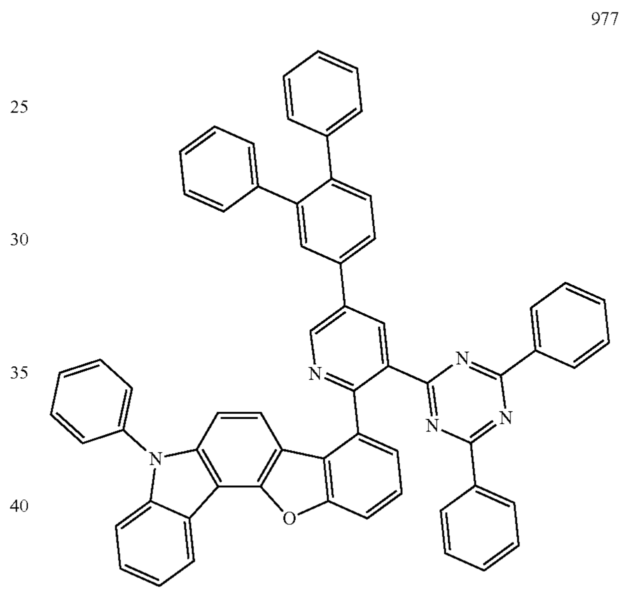
978
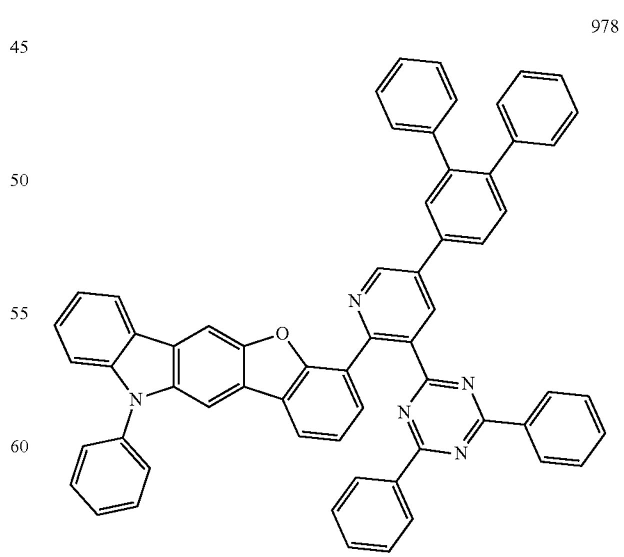

-continued
979
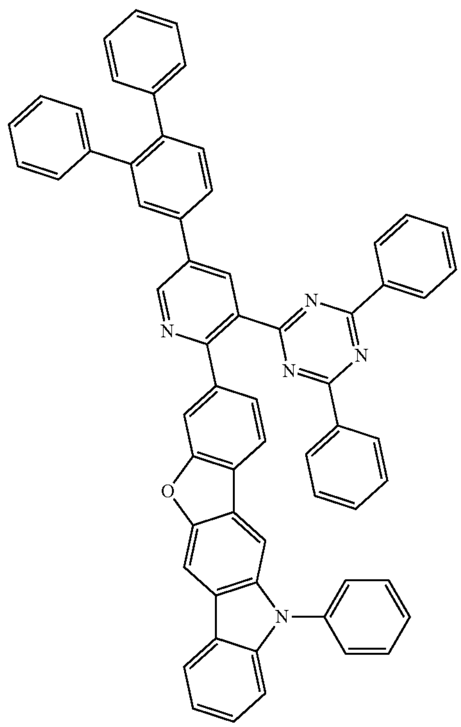
980
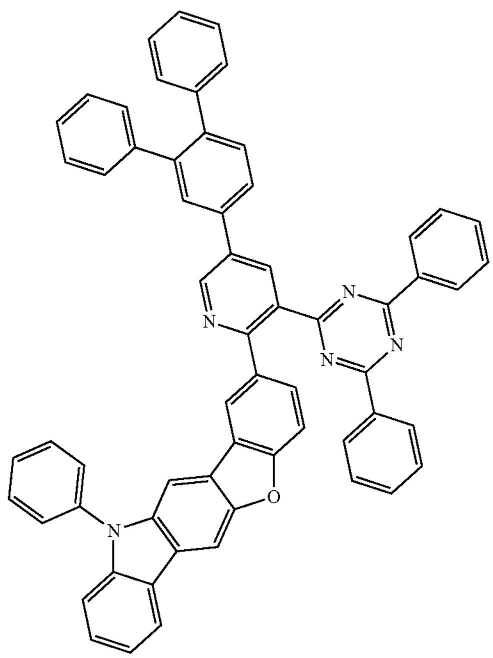
-continued
981
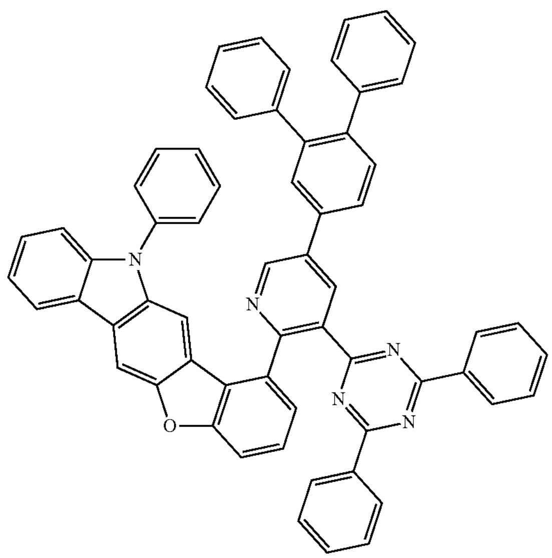
982
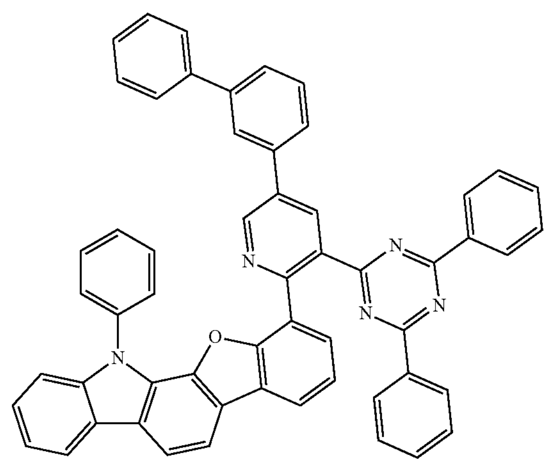

-continued
983
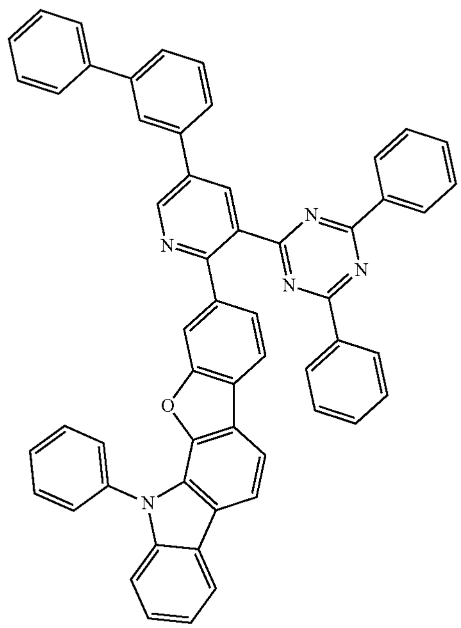
984
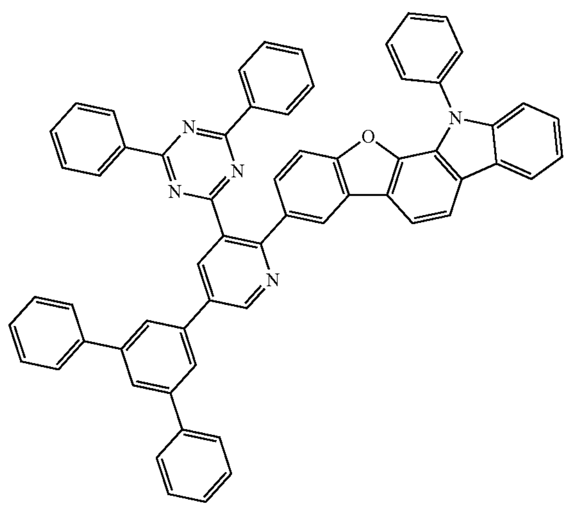
-continued
985
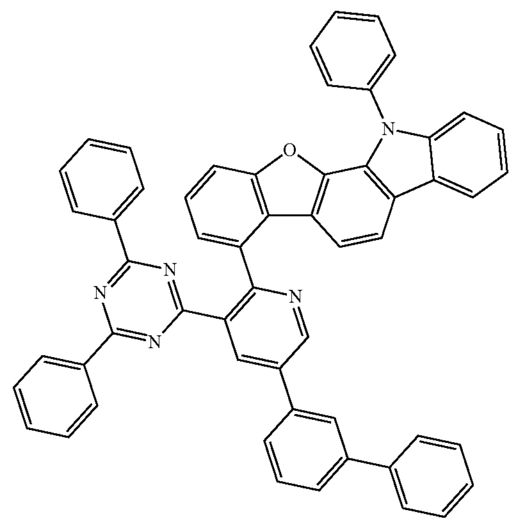
986
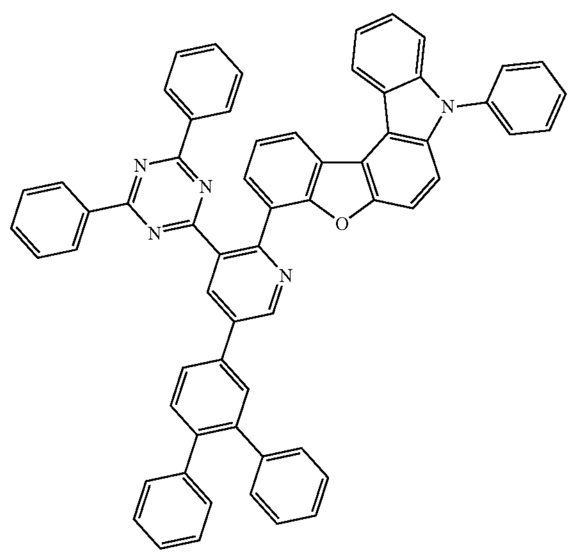

-continued
987
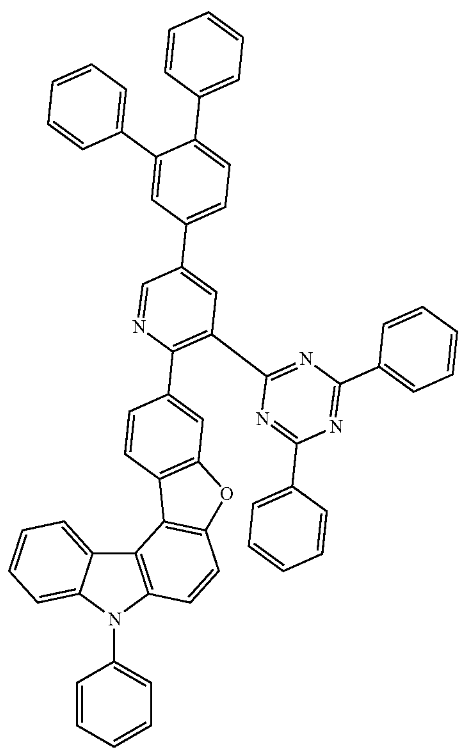
988
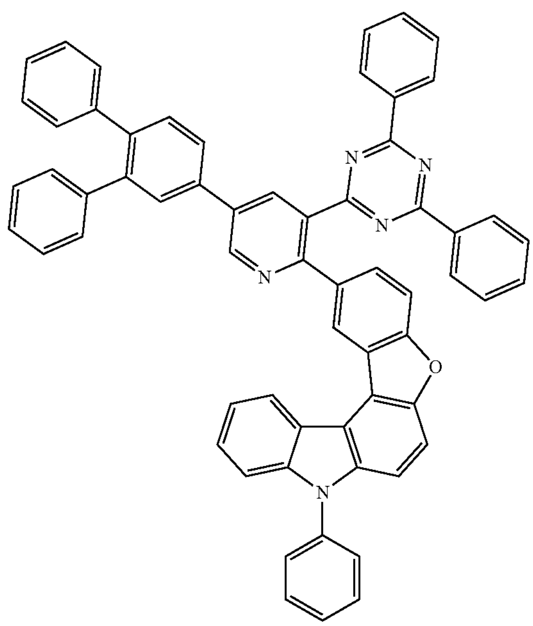
-continued
989
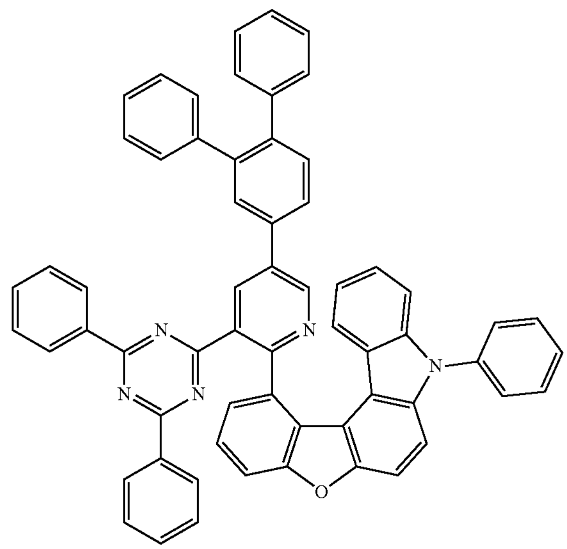
990
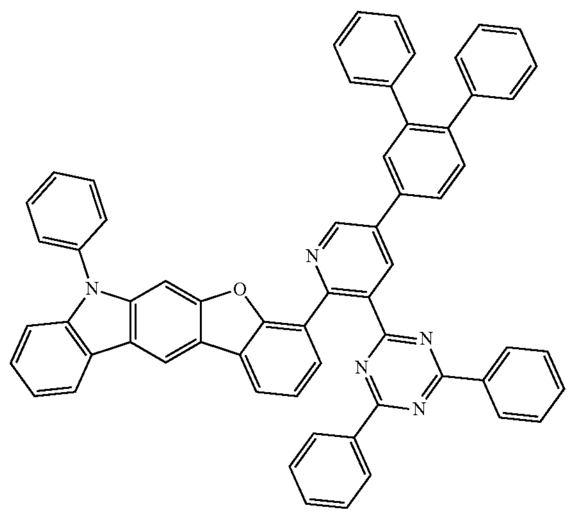
991
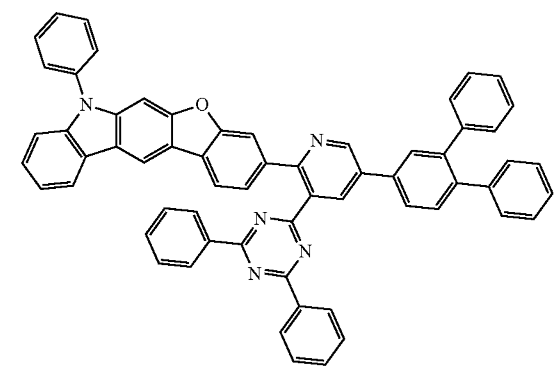

-continued
992
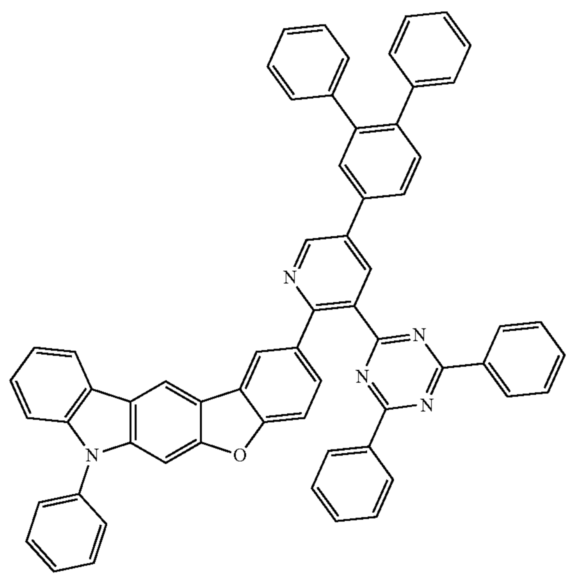
993
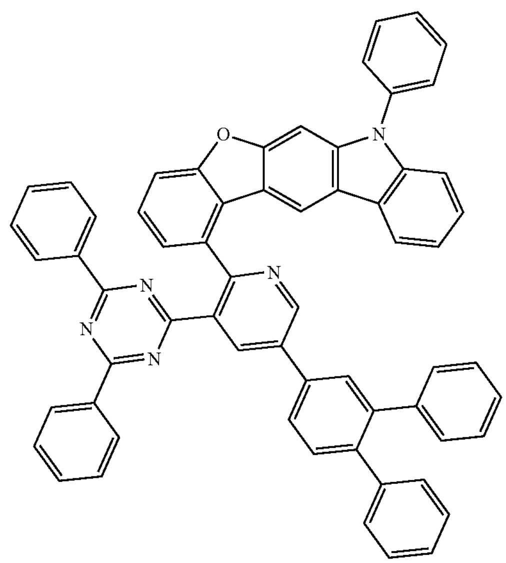
-continued
994
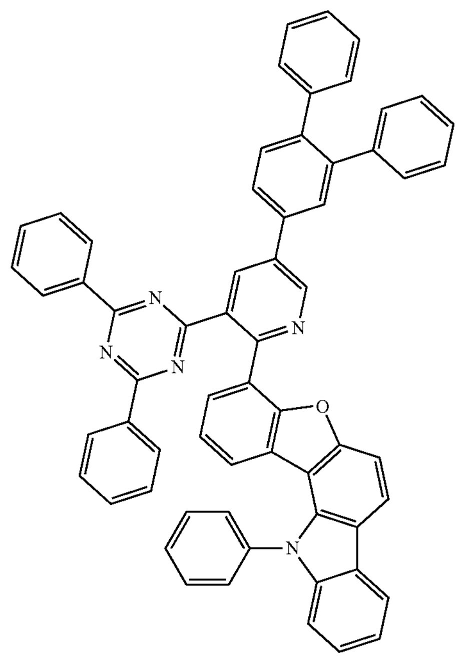
995
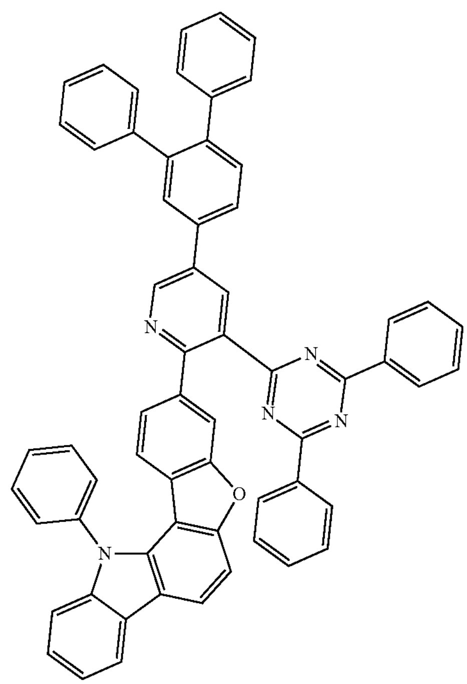

-continued
996
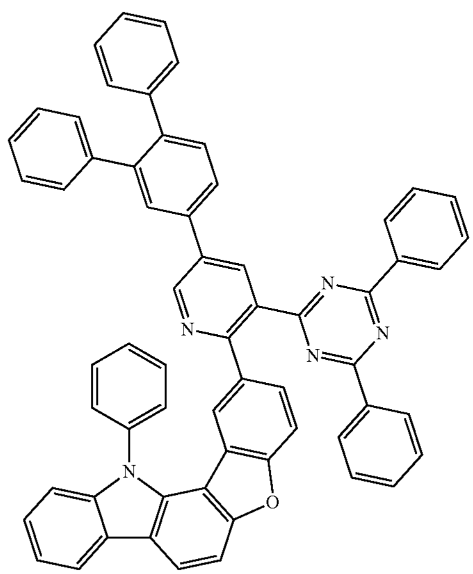
997
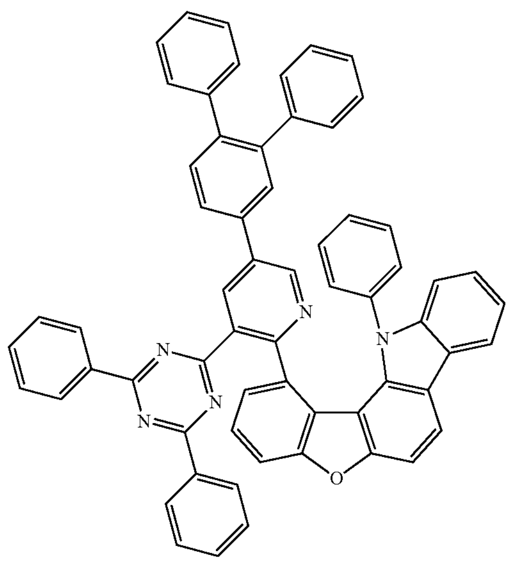
-continued
998
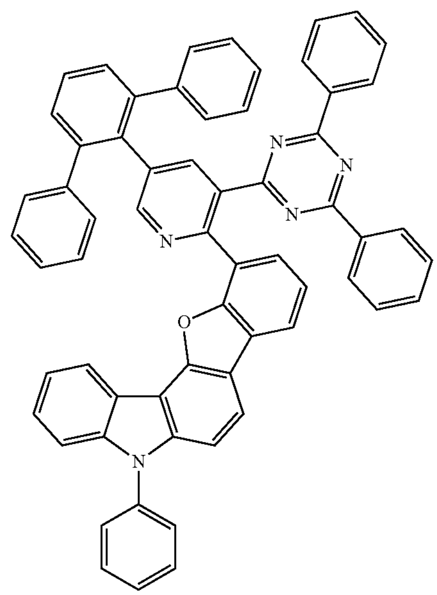
999
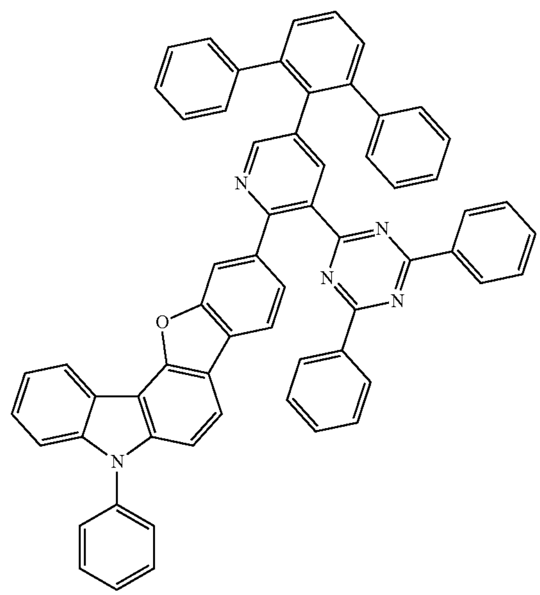
1000
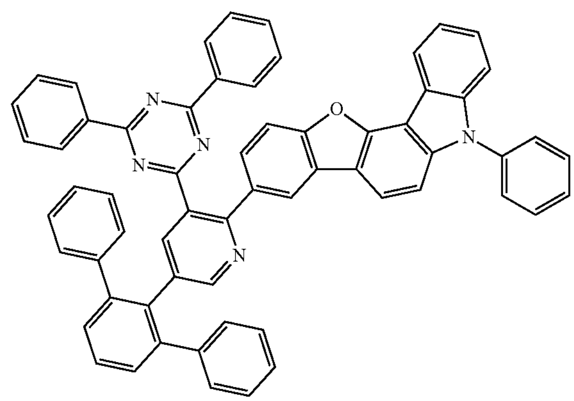

-continued
1001
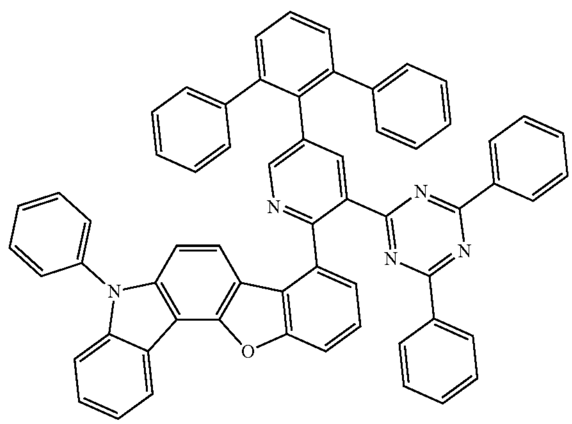
1002
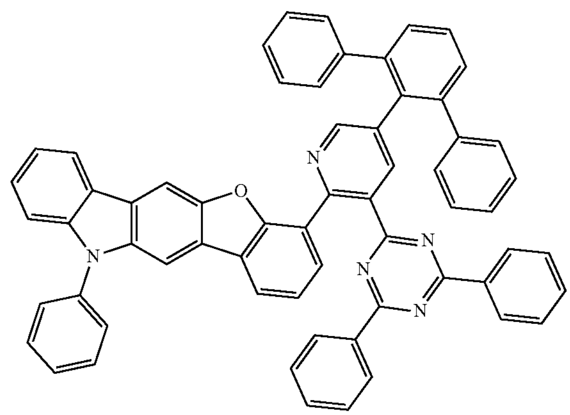
1003
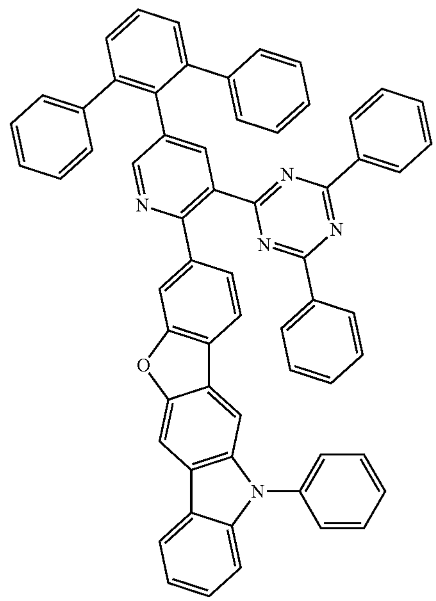
1004
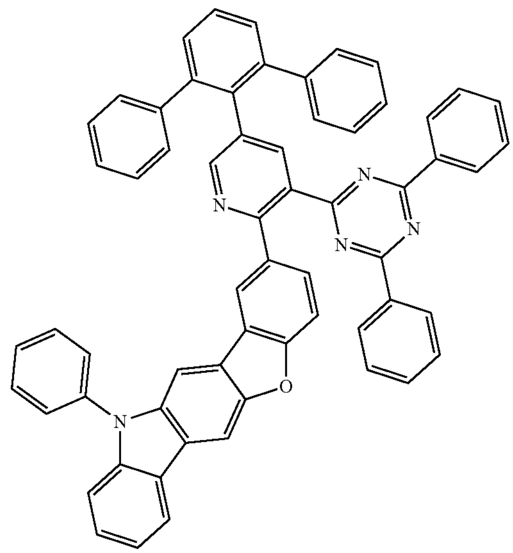
1005
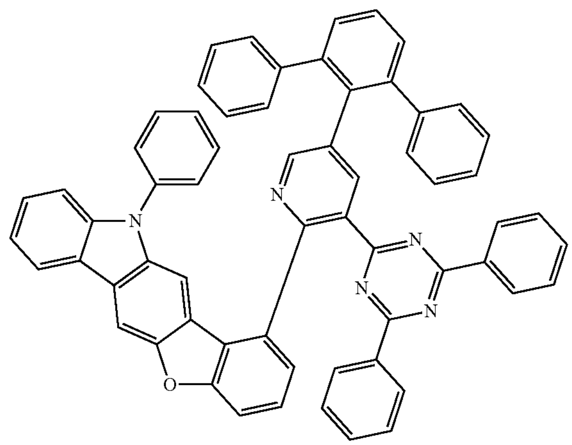
1018
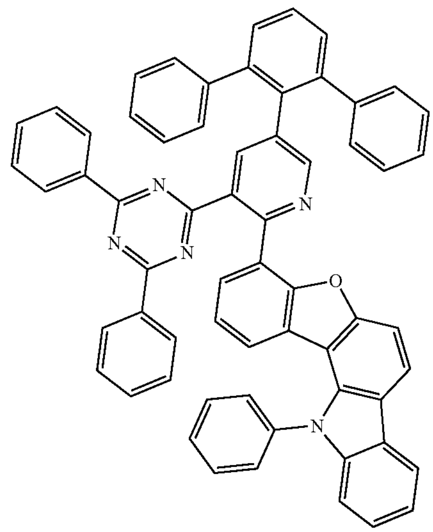

-continued
1019
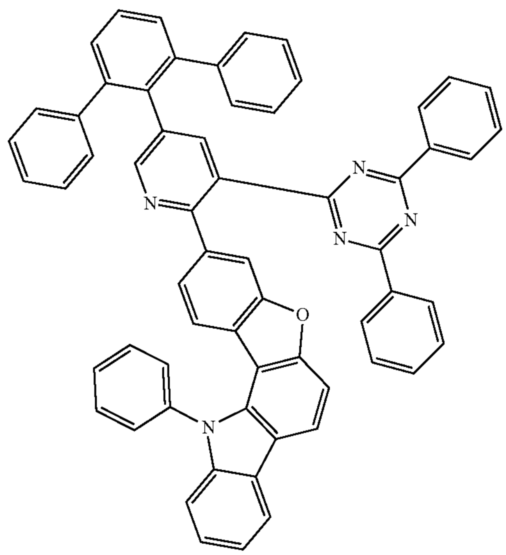
1020
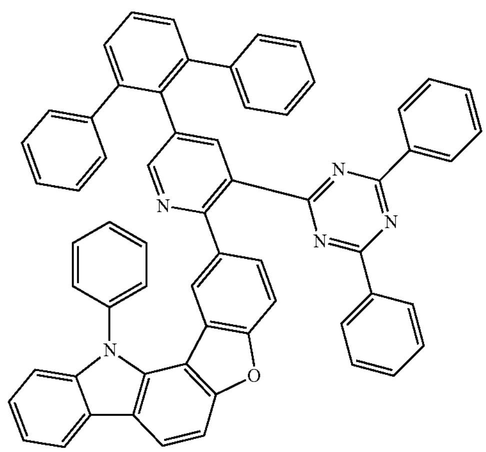
1021
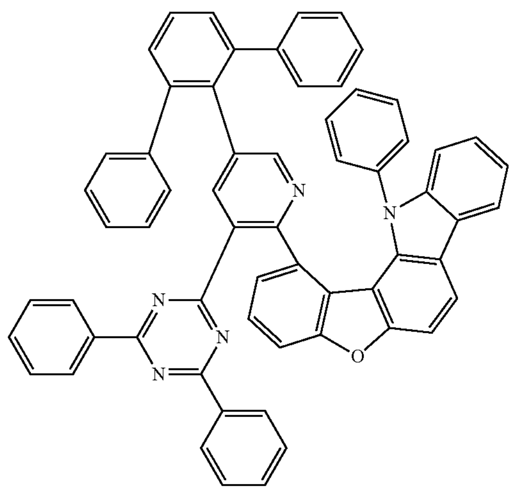
-continued
1022
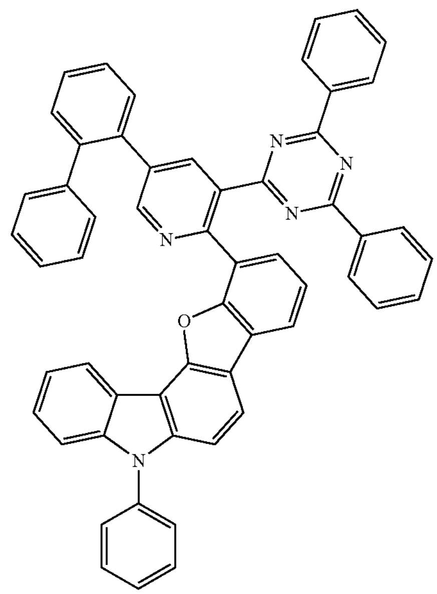
1023
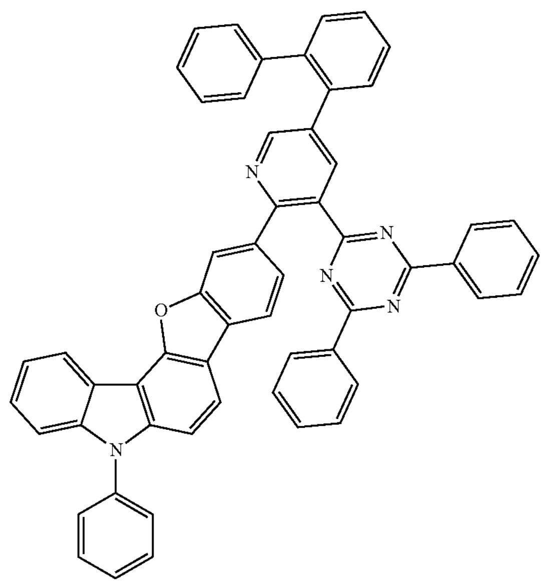
1024
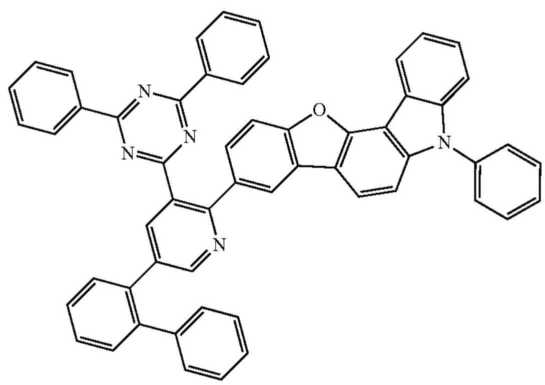

-continued
1025
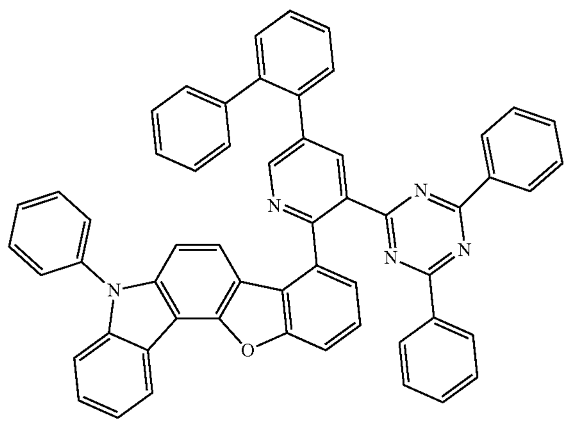
1026
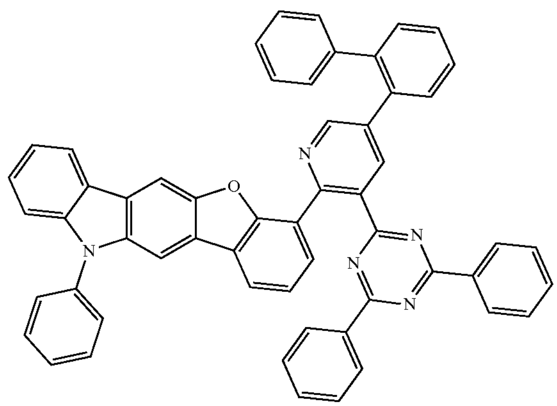
1027
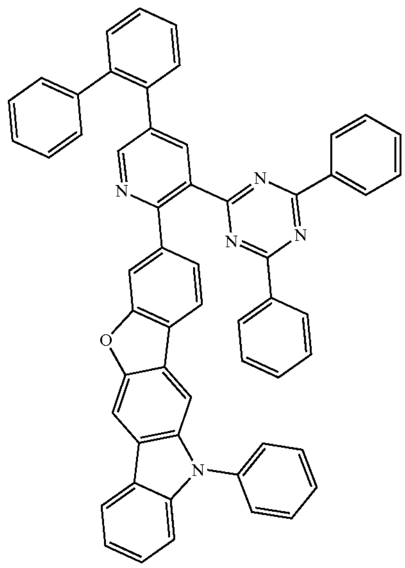
-continued
1028
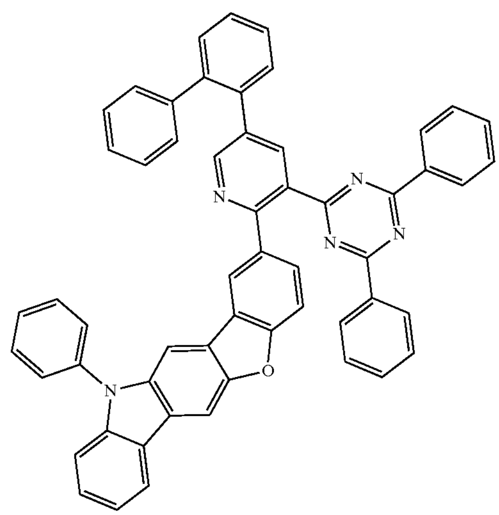
1029
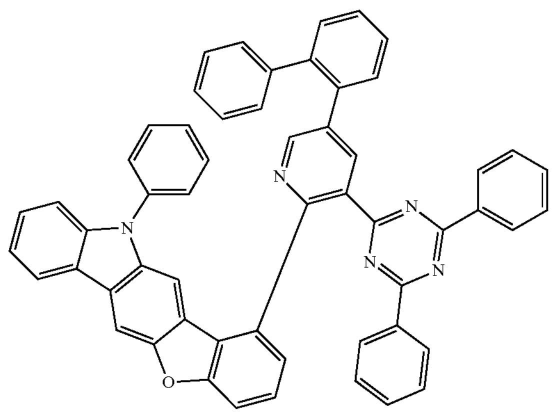
1030
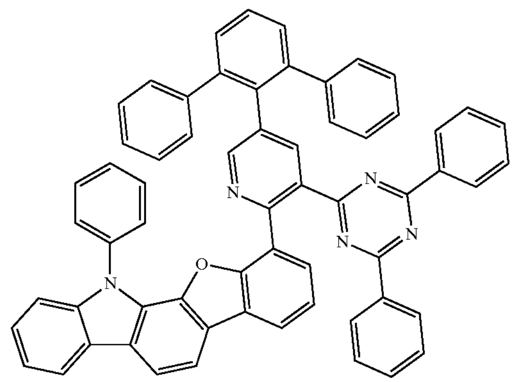

-continued
1031
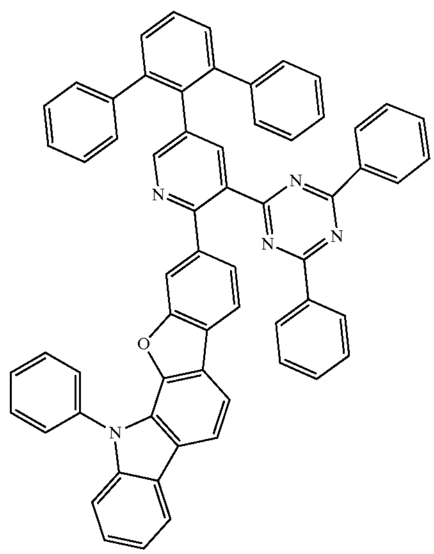
1032
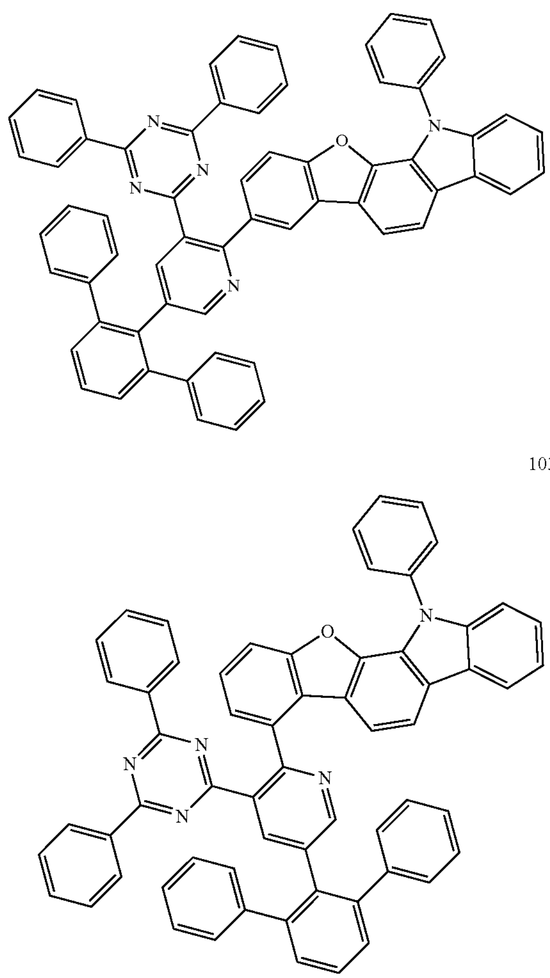
1033
-continued
1034
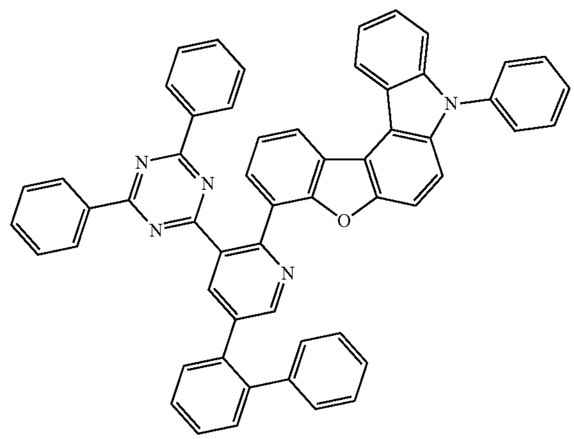
1035
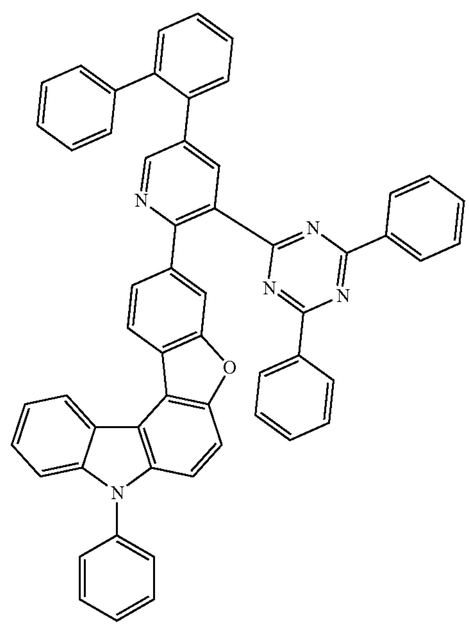

-continued
1036
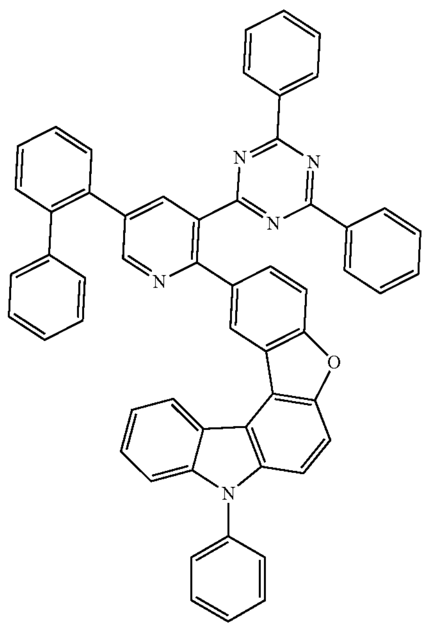
1037
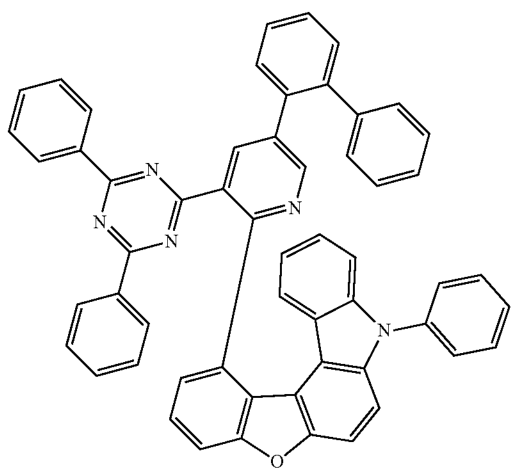
1038
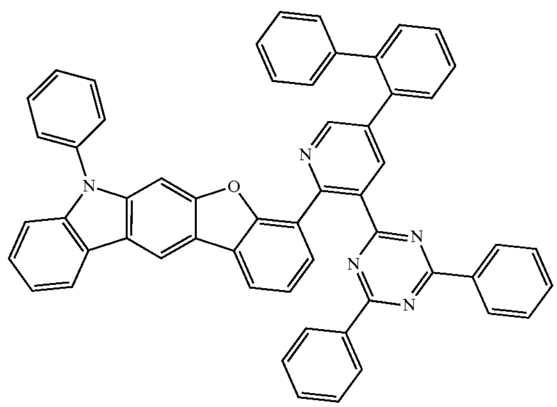
-continued
1039
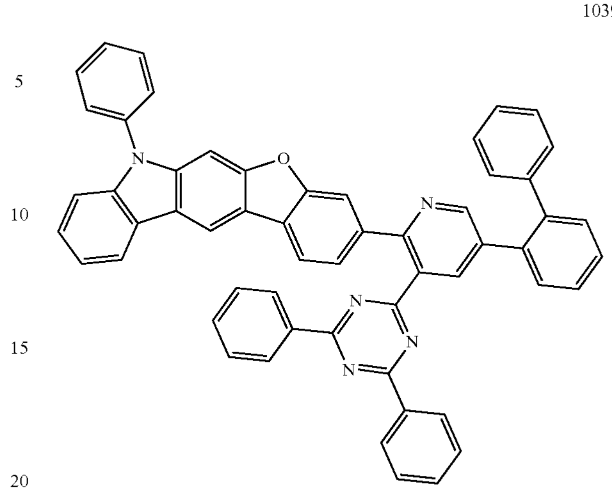
1040
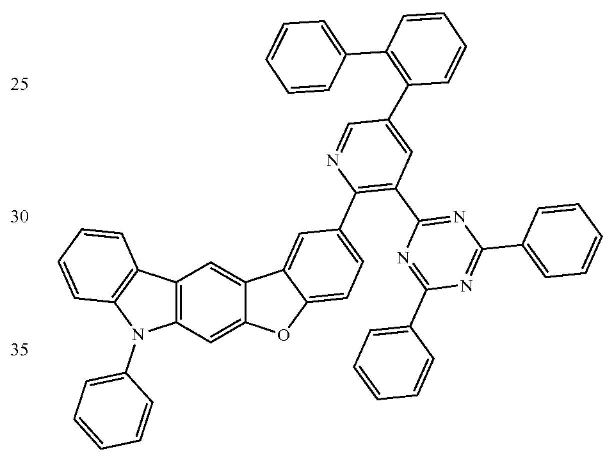
1041
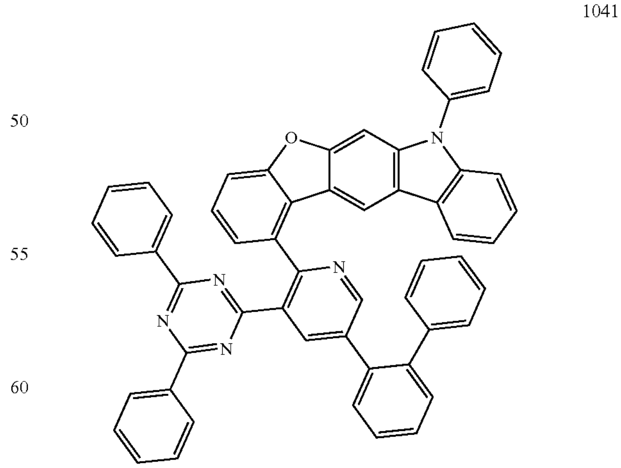

-continued
1042
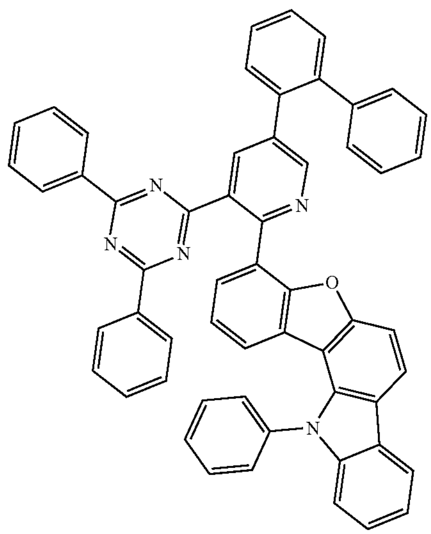
1043
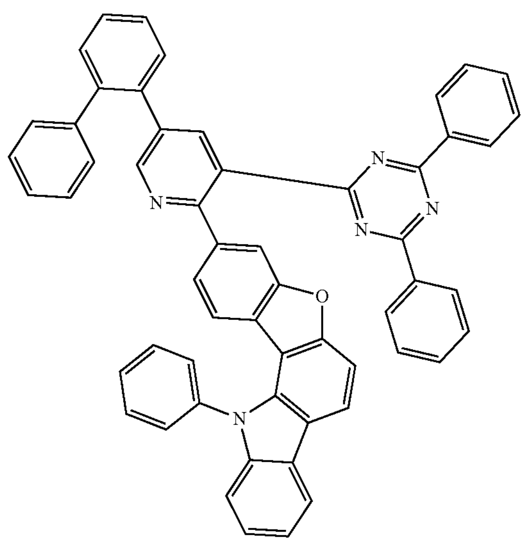
1044
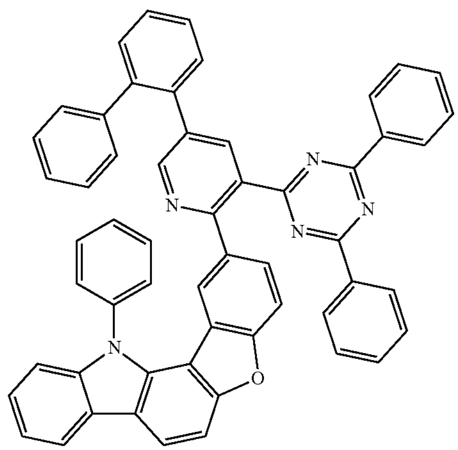
-continued
1045
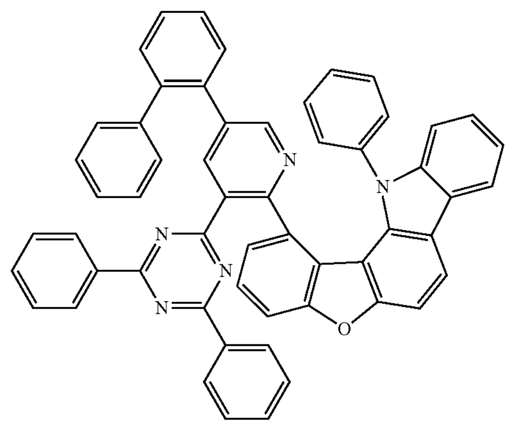
1046
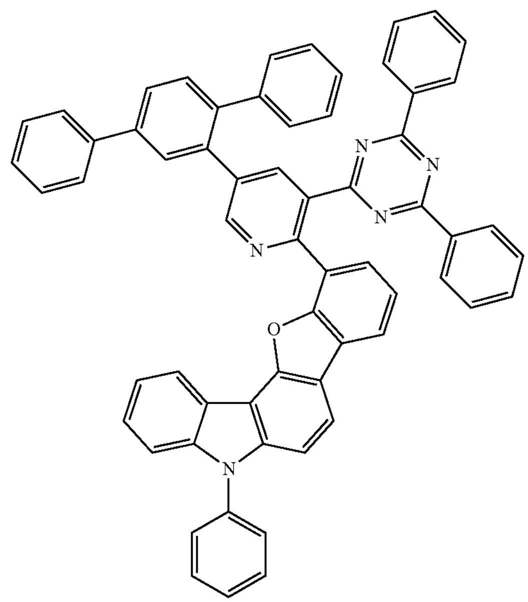

-continued
1047
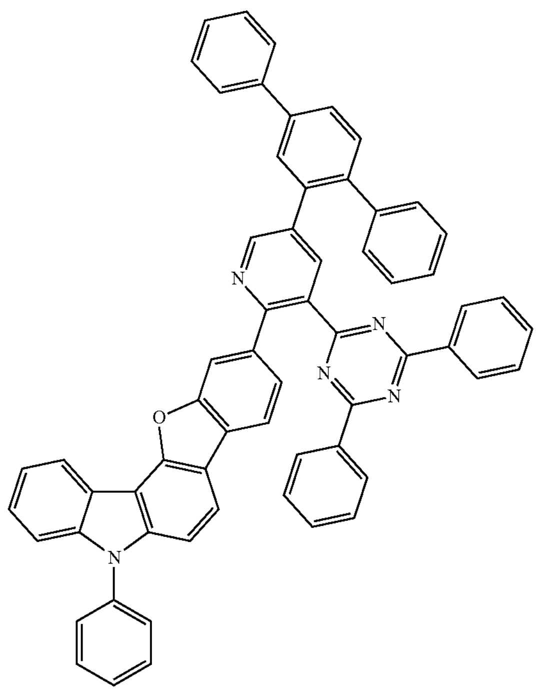
1048
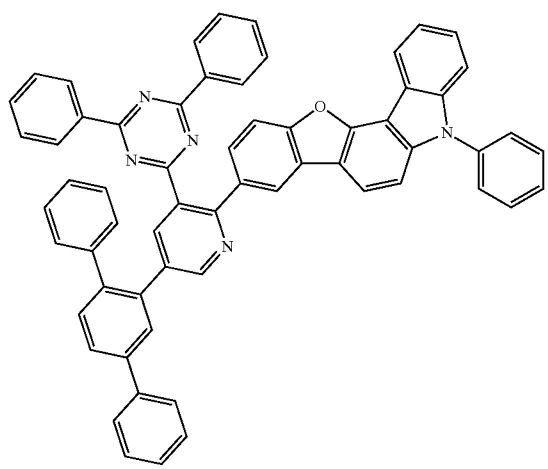
1049
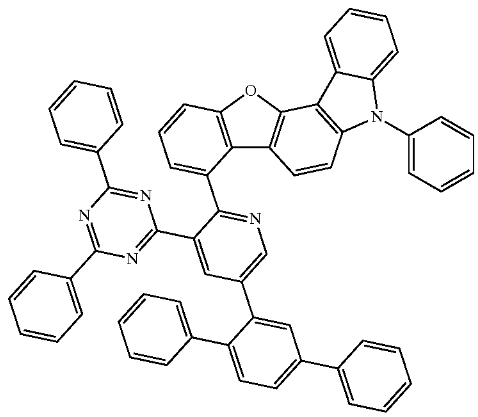
-continued
1050
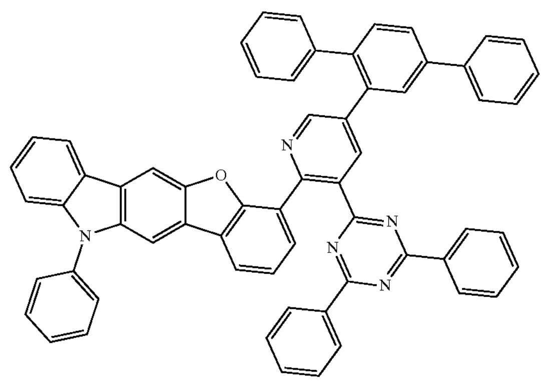
1051
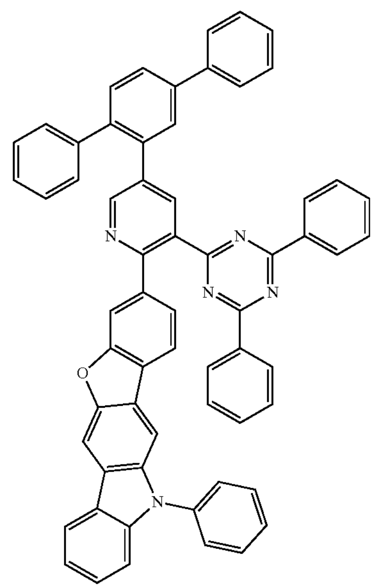
1052
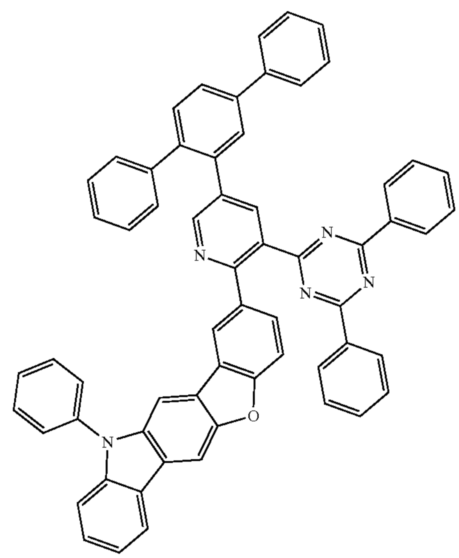

-continued
1053
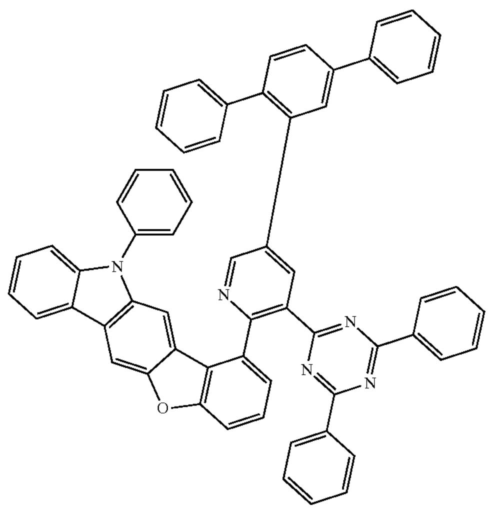
1054
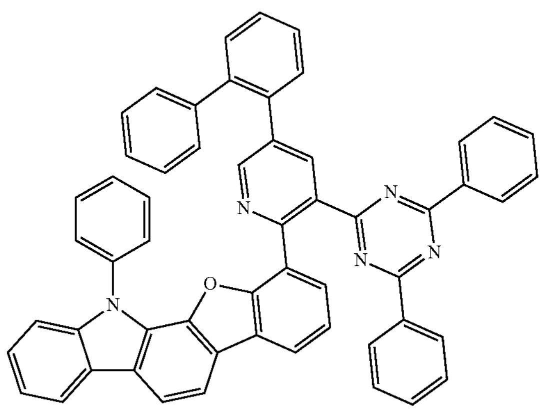
1055
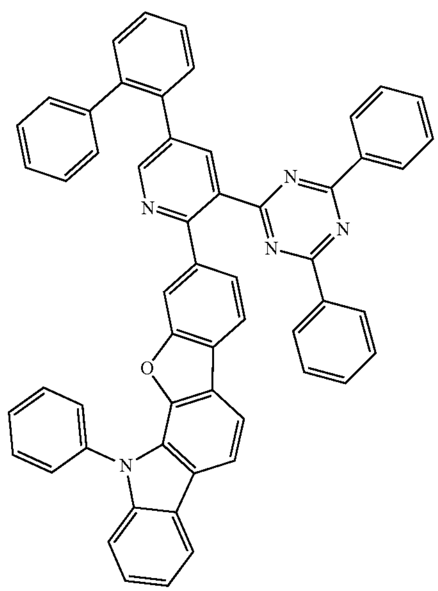
1056
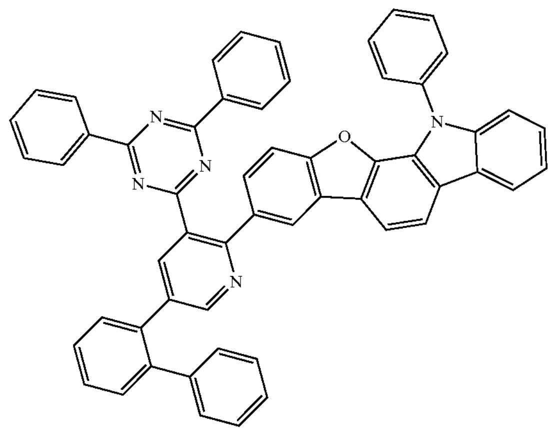
1057
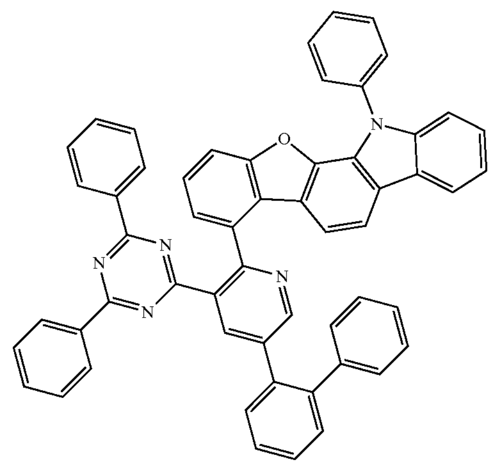
1058
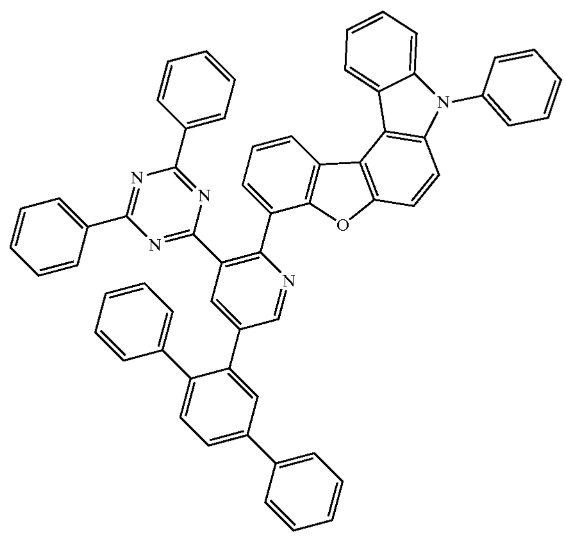

-continued
1059
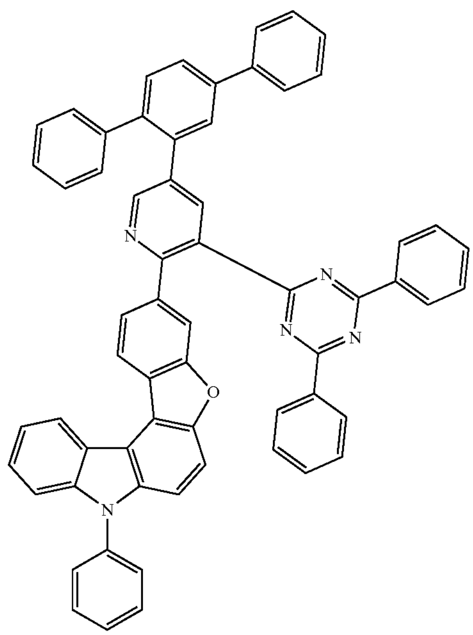
1060
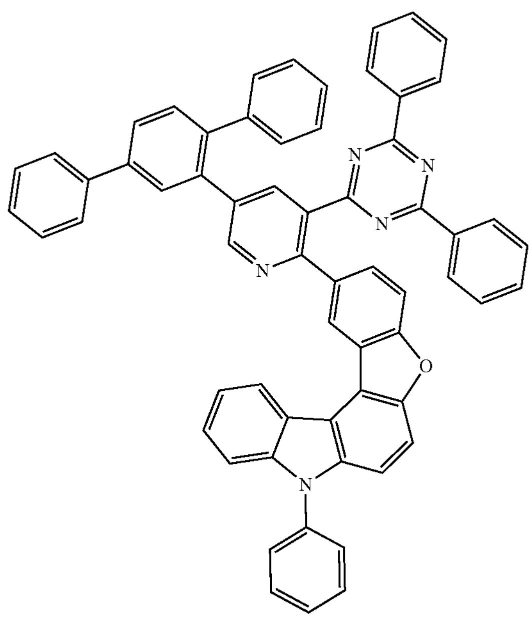
-continued
1061
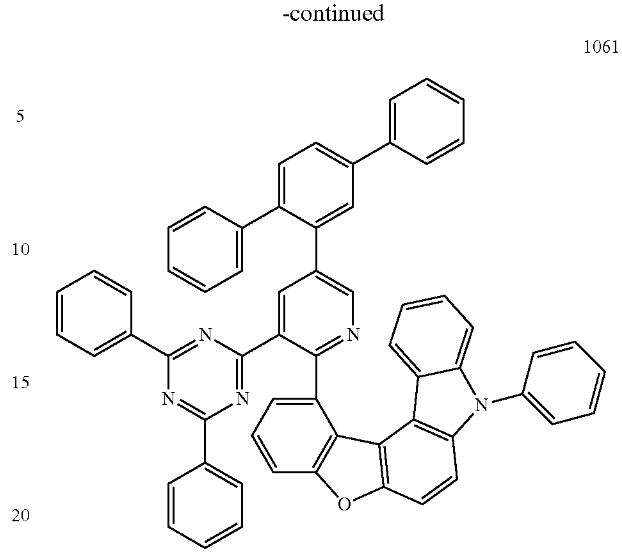
1062
1063
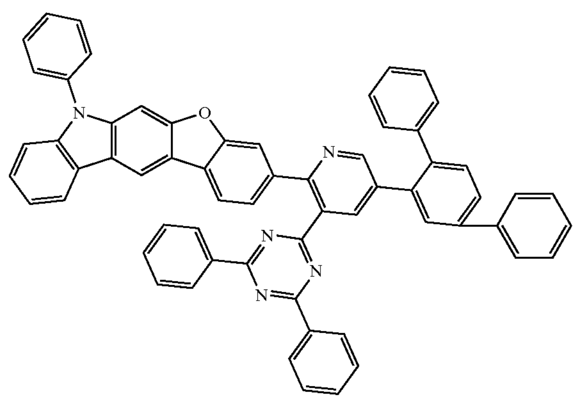

-continued
1064
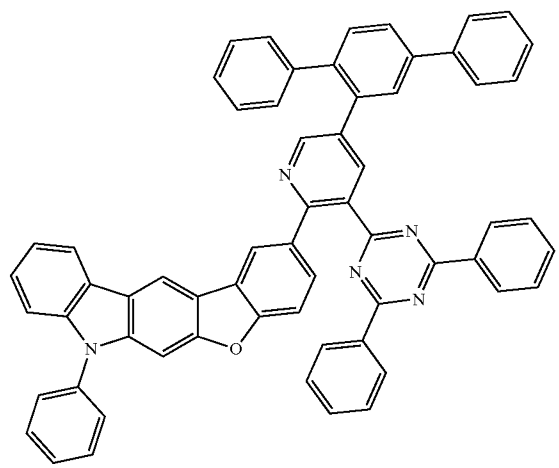
1065
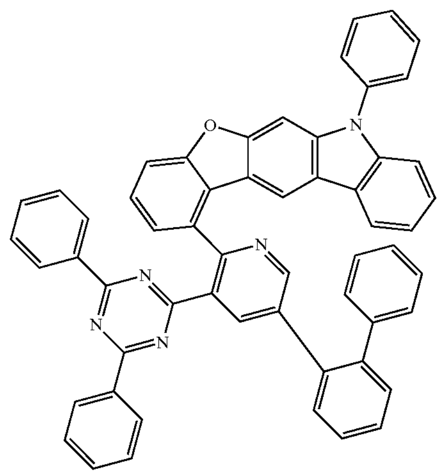
1066
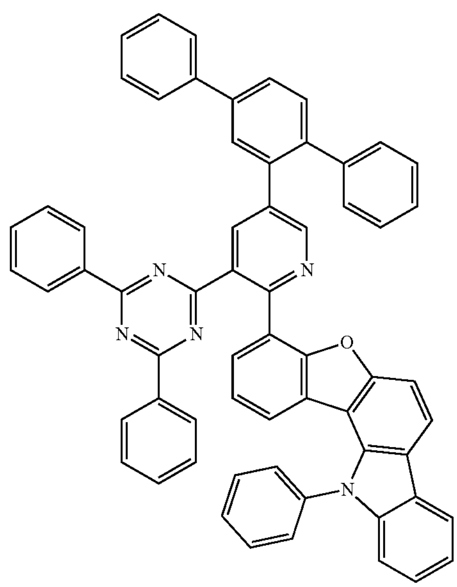
-continued
1067
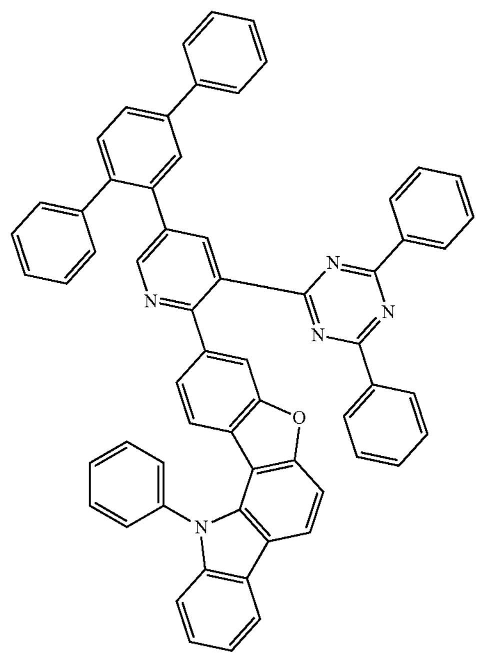
1068
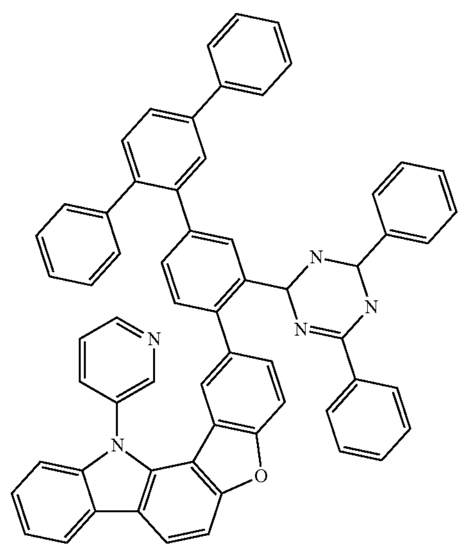

-continued
1069
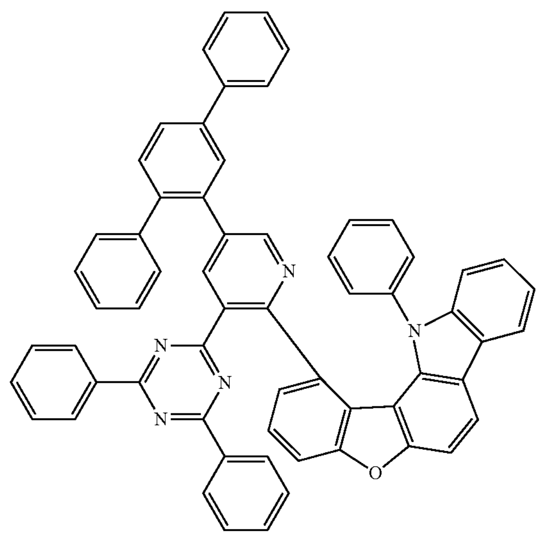
1070
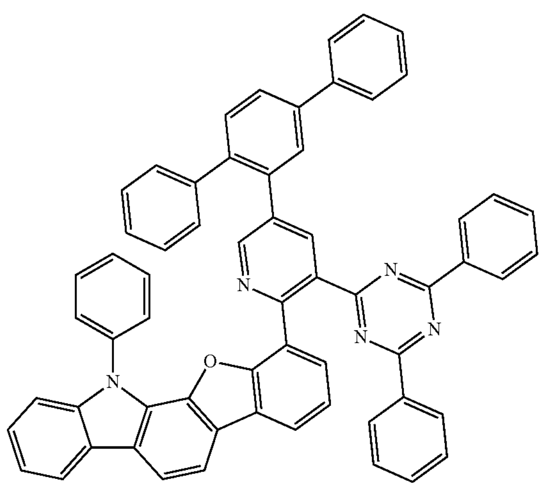
-continued
1071
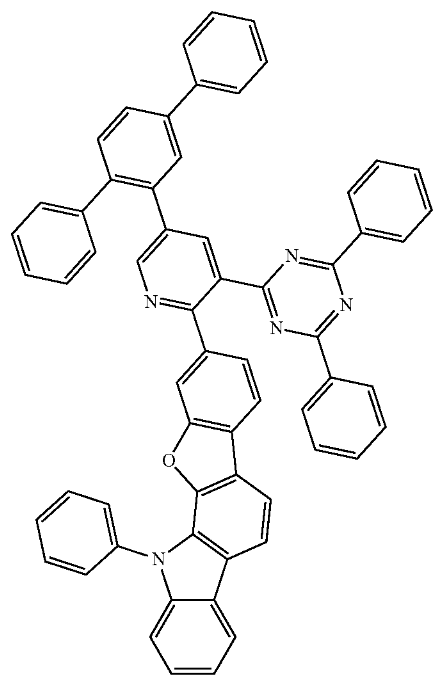
1072
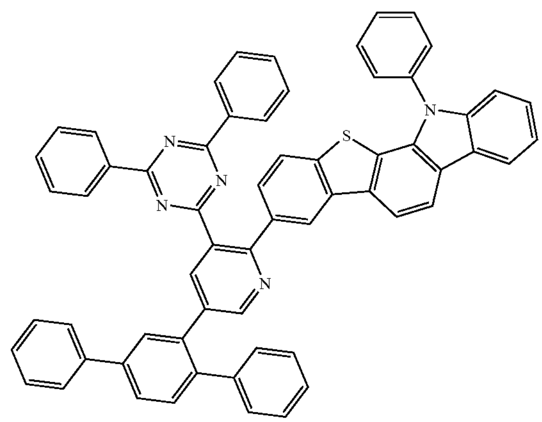
1073
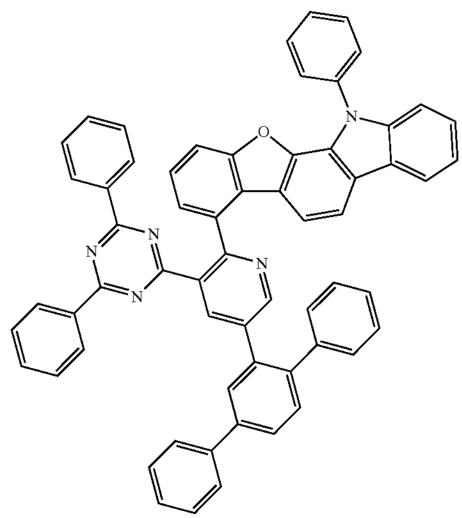

-continued
1074
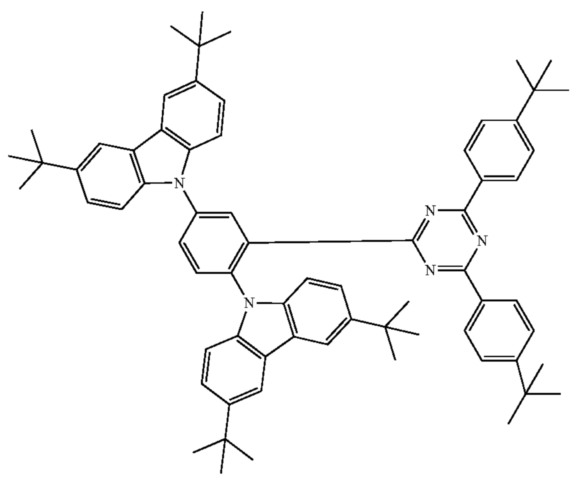
1075
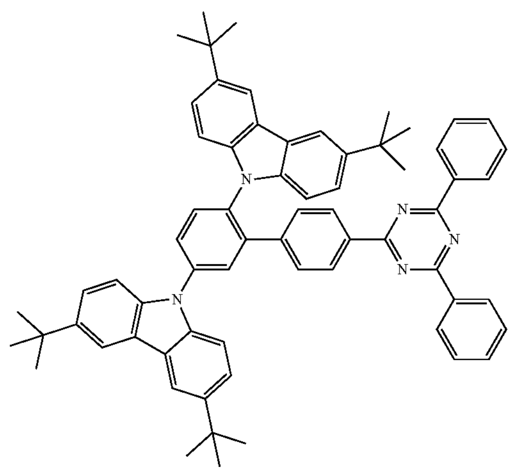
1076
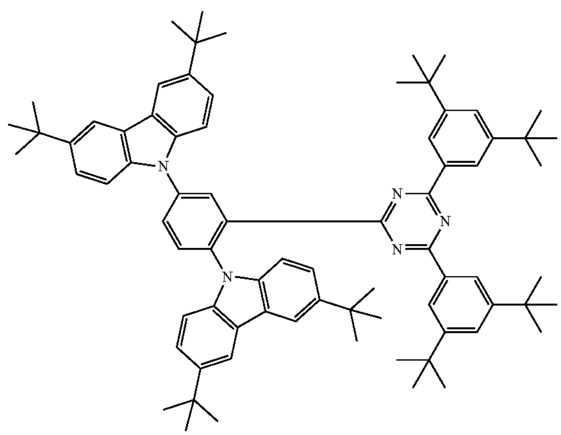
-continued
1077
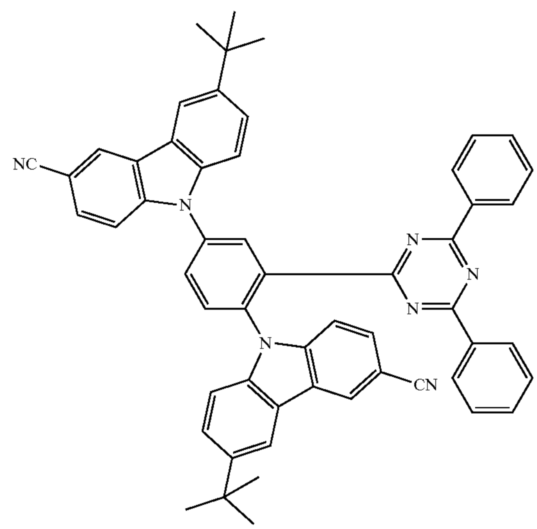
1078
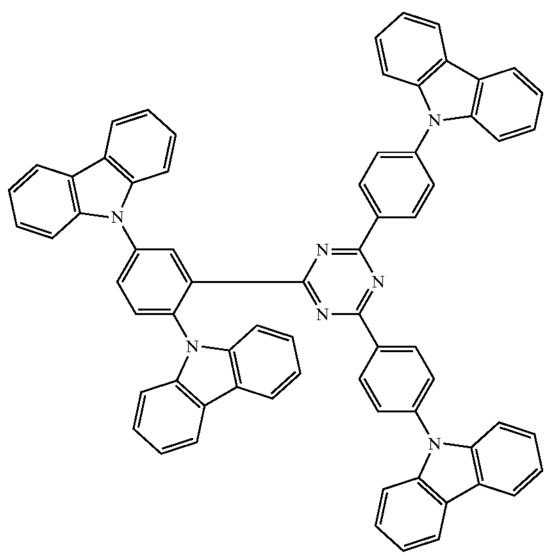

Group XV
1
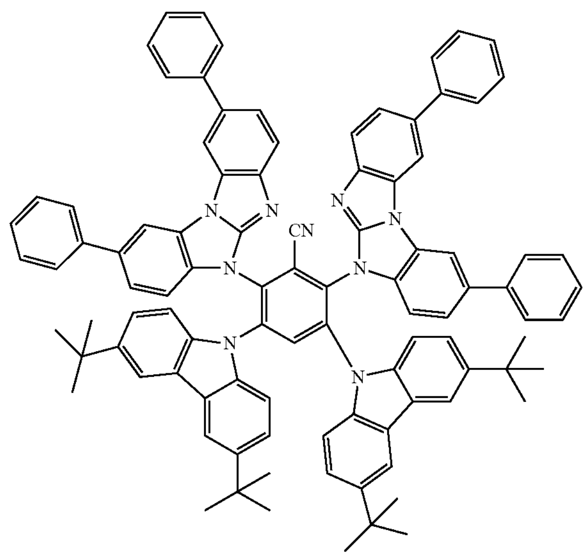
2
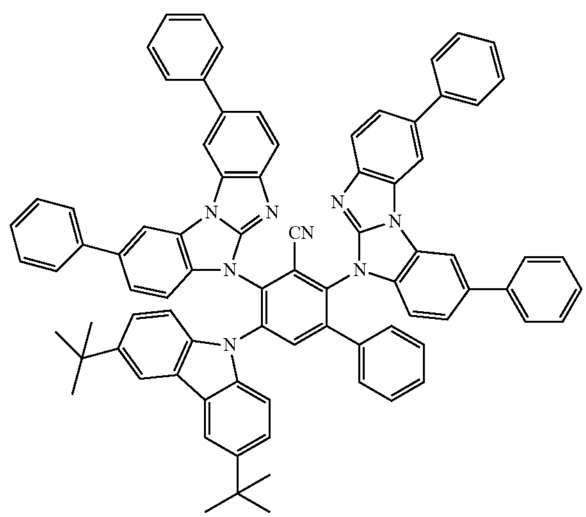
-continued
3
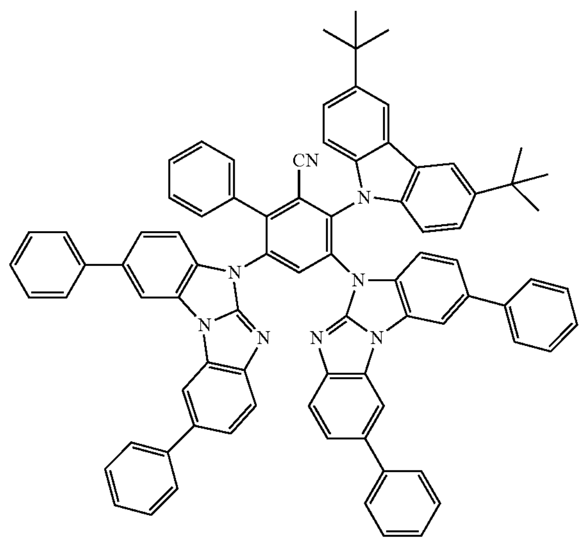
4
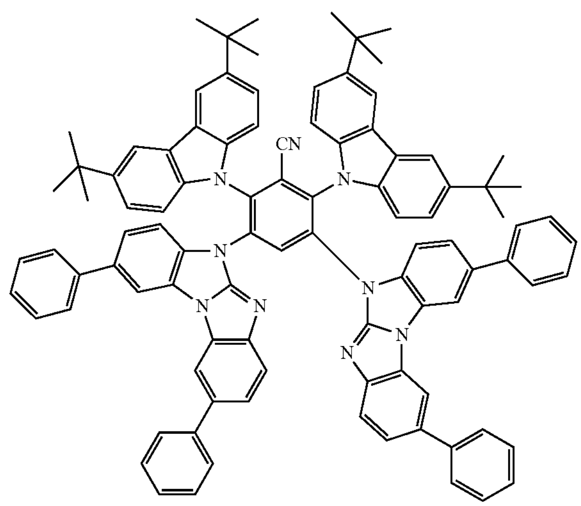
5
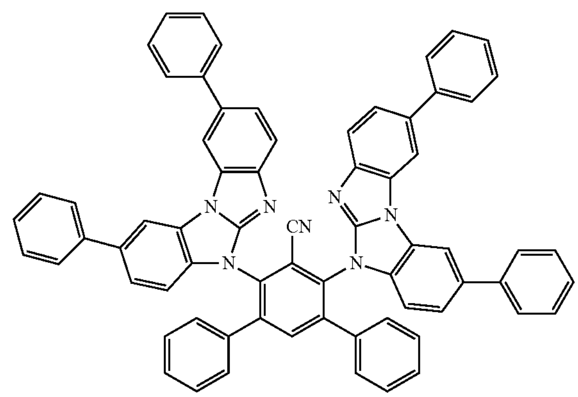

-continued
6
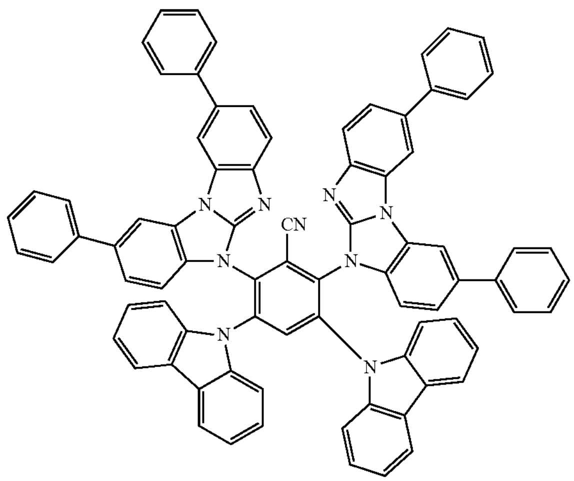
7
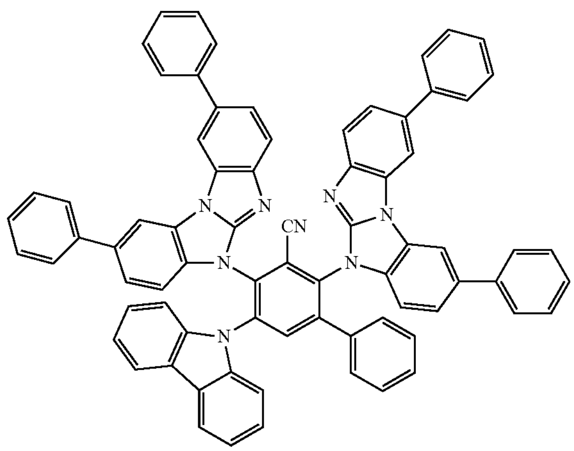
8
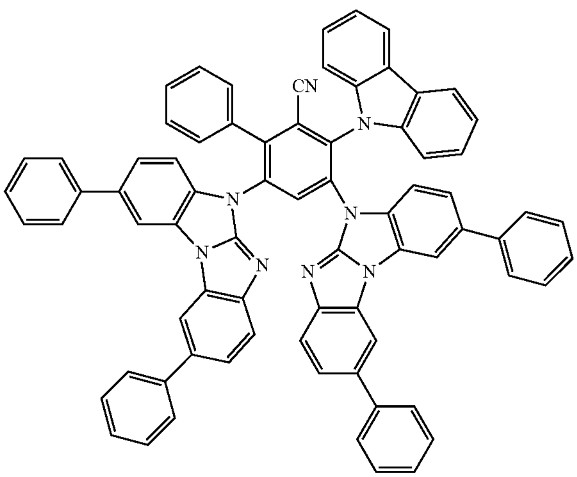
-continued
9
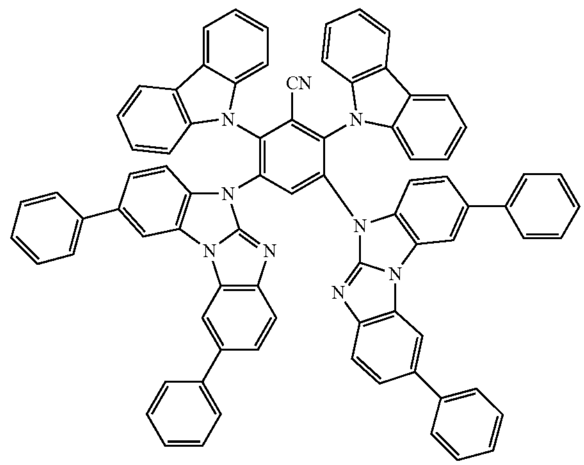
10
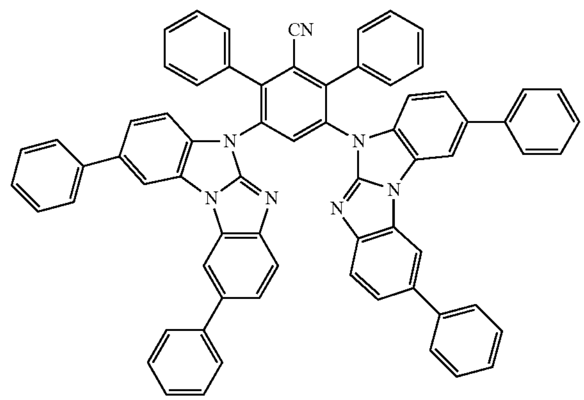
11
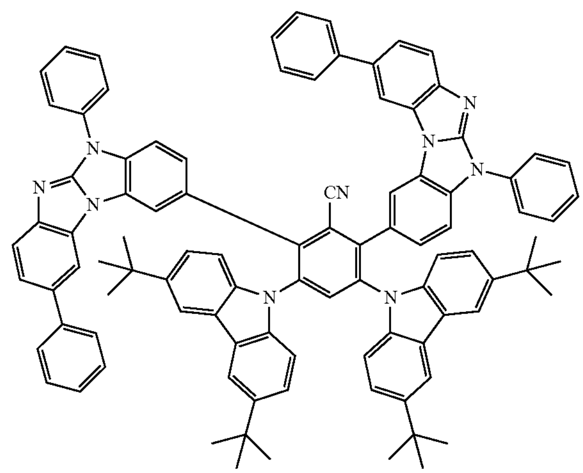

-continued
12
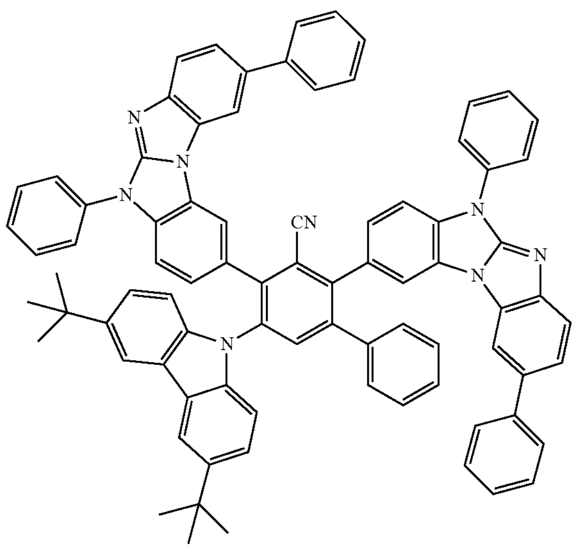
13
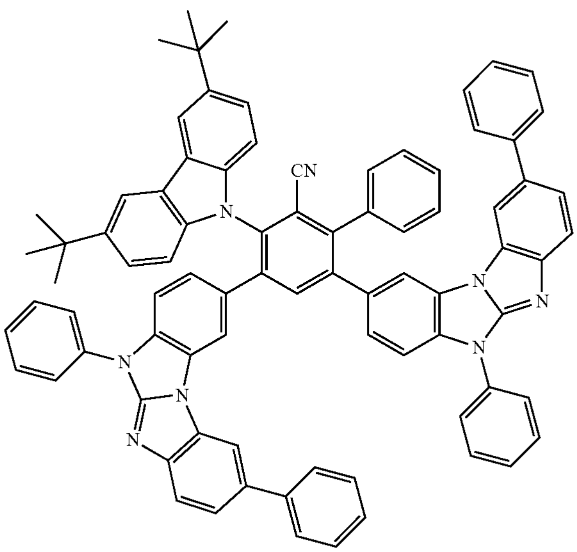
14
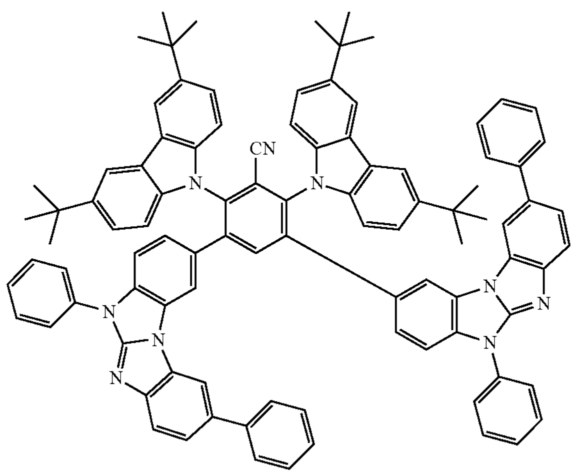
-continued
15
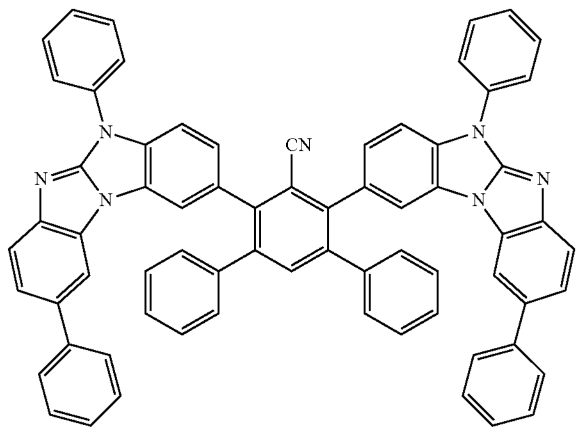
16
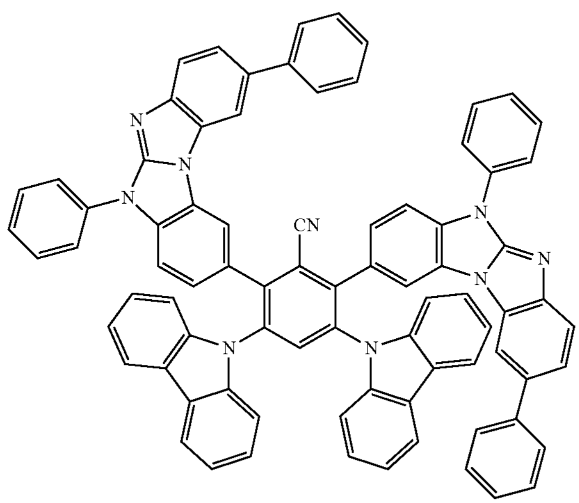
17
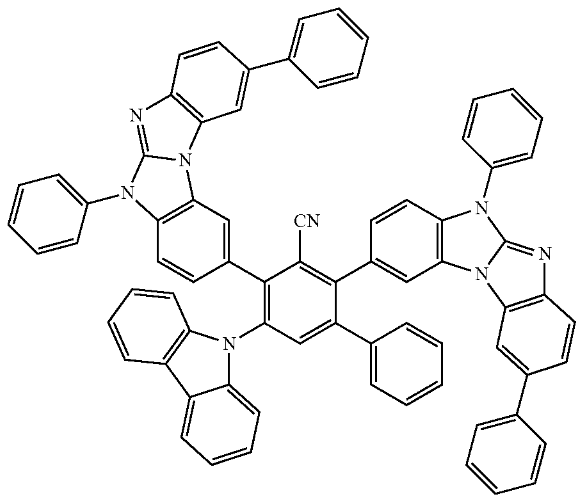

-continued
18
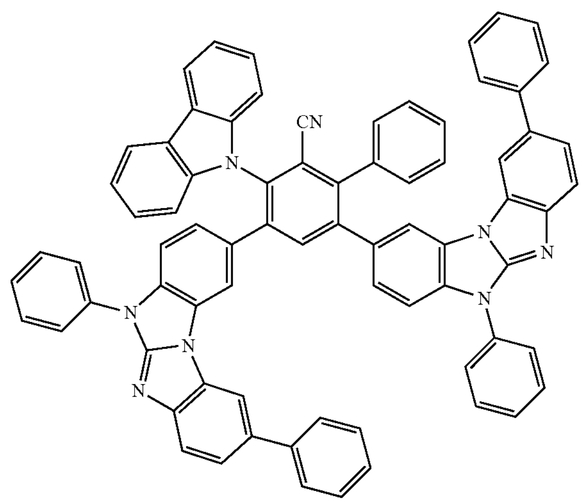
19
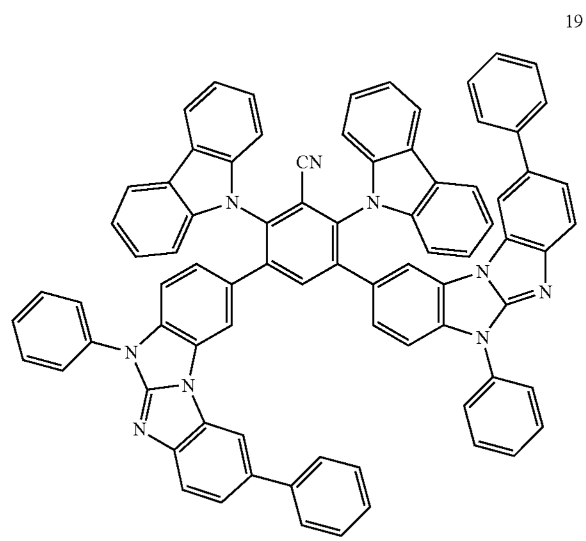
20
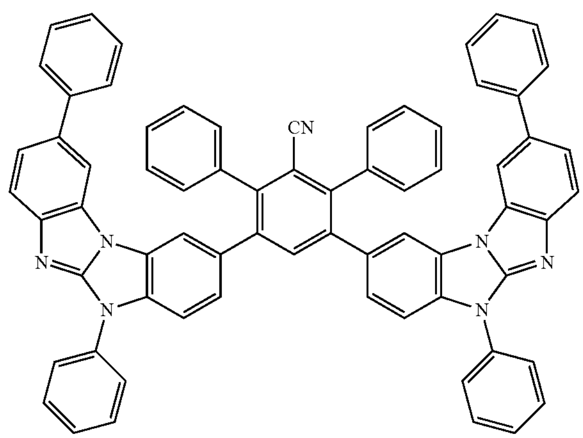
-continued
21
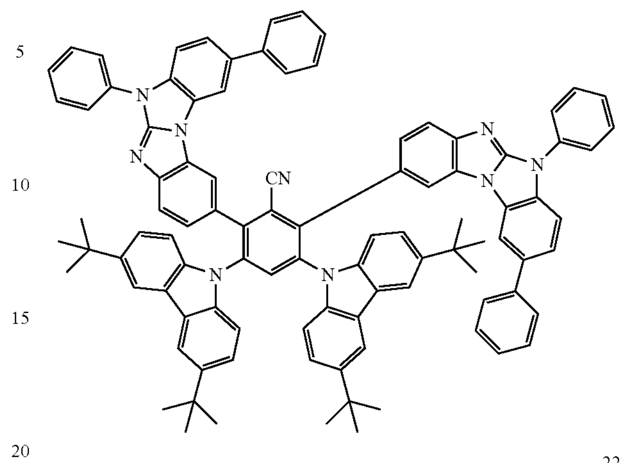
22
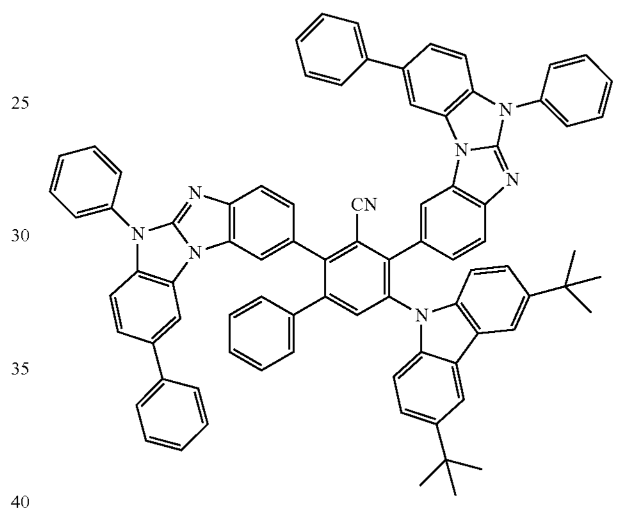
23
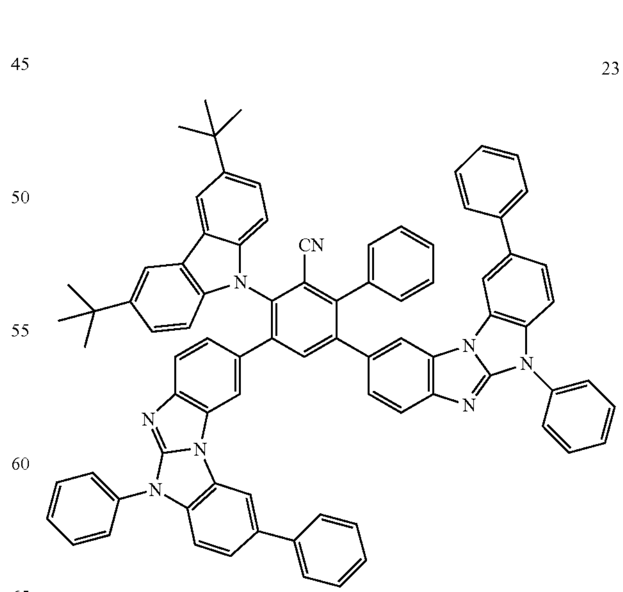

-continued
24
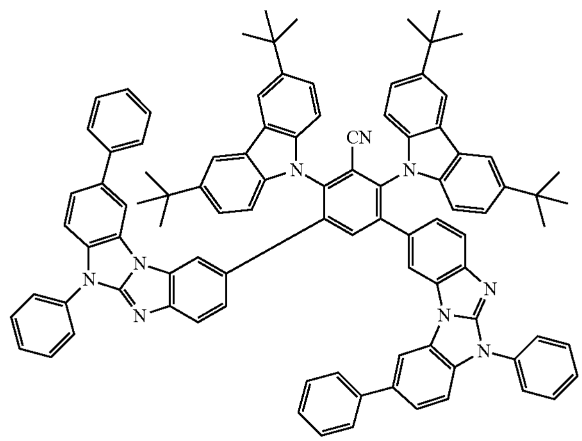
25
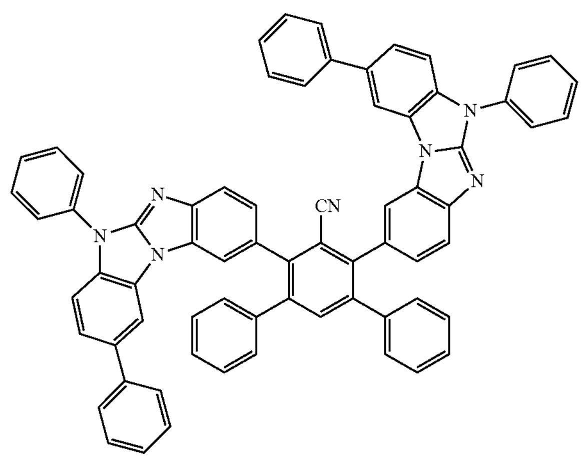
26
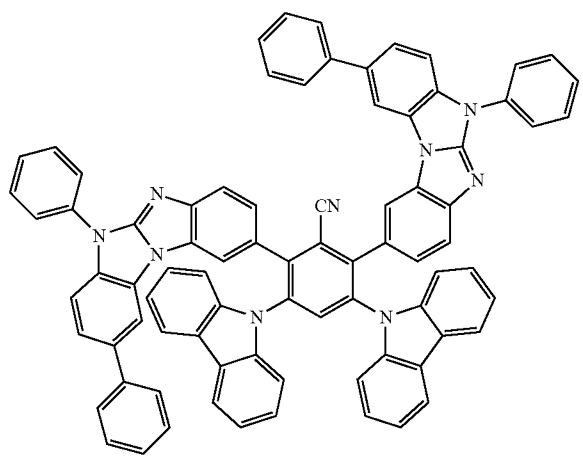
-continued
27
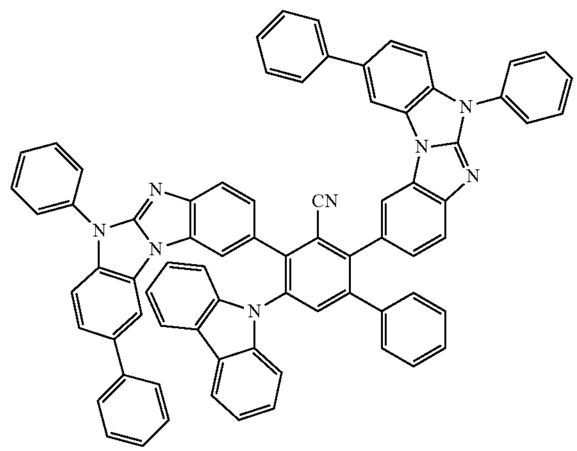
28
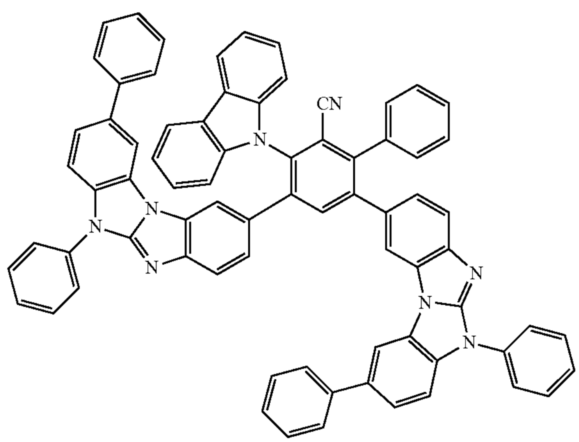
29
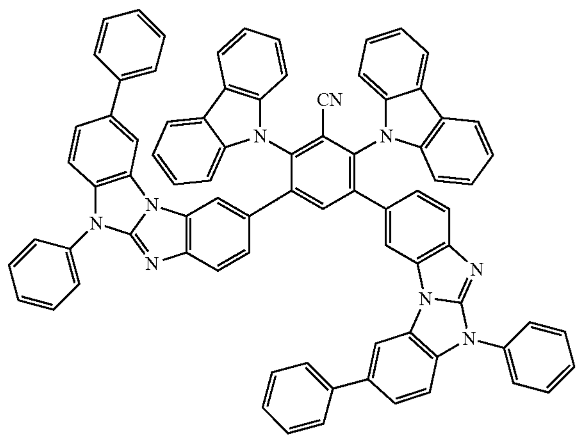

-continued
30
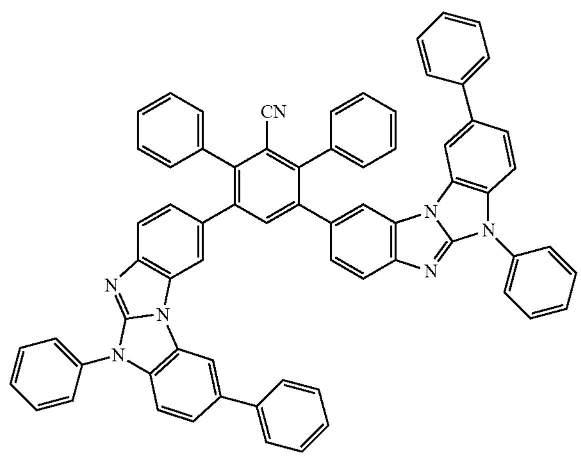
31
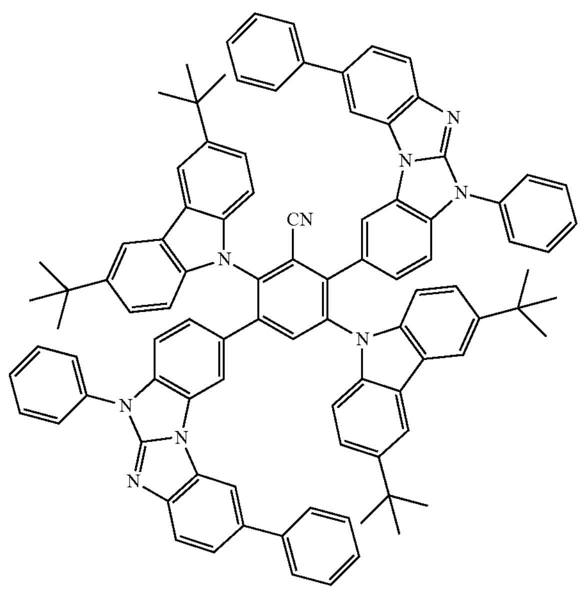
-continued
32
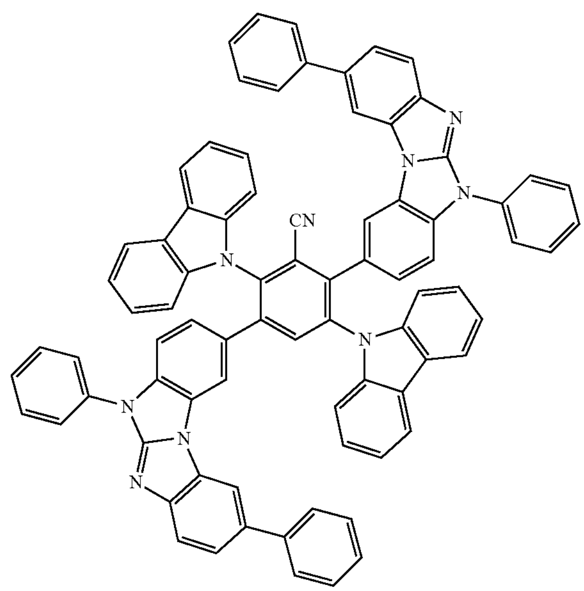
33
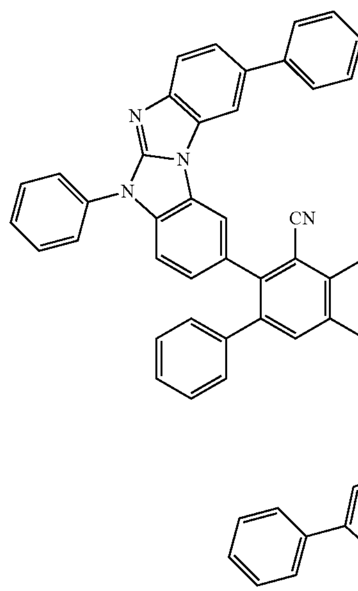

-continued
34
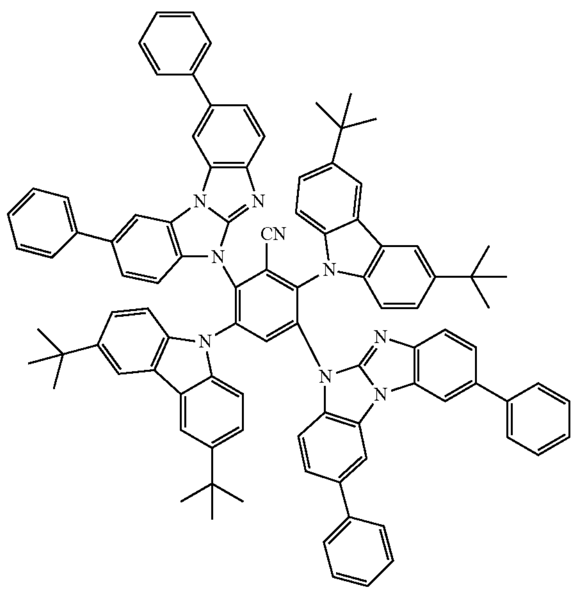
35
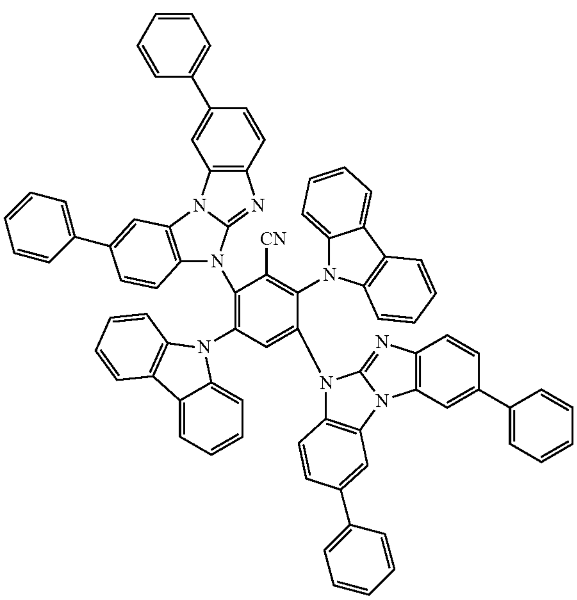
-continued
36
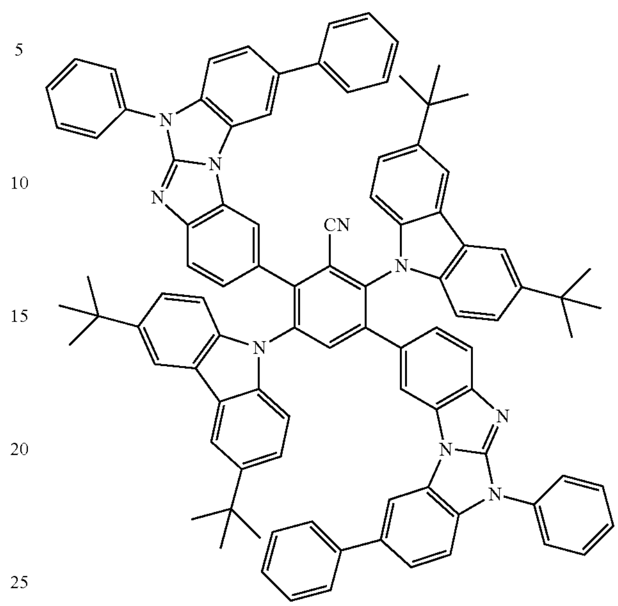
37
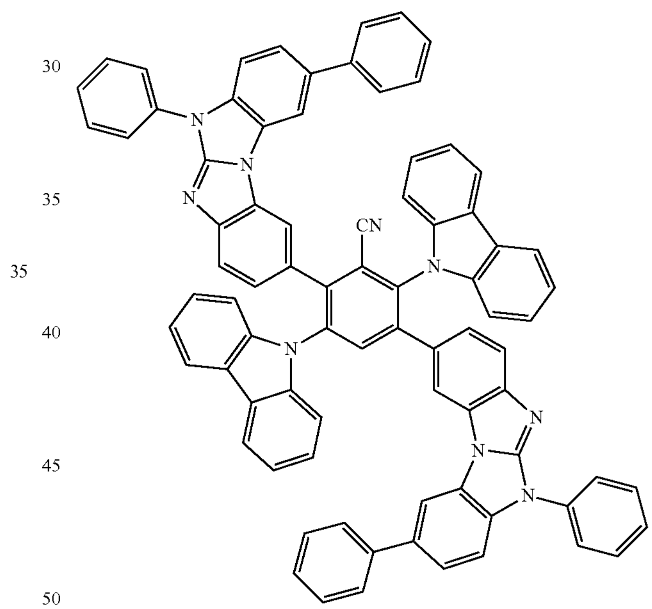
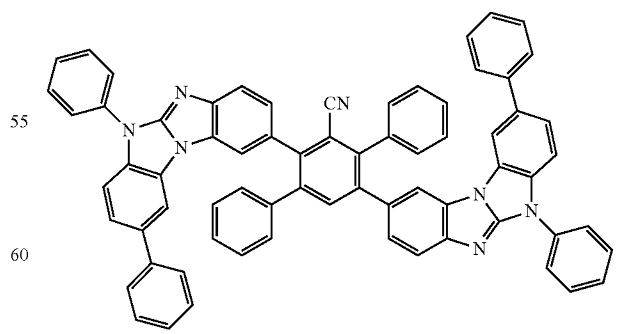

-continued

39

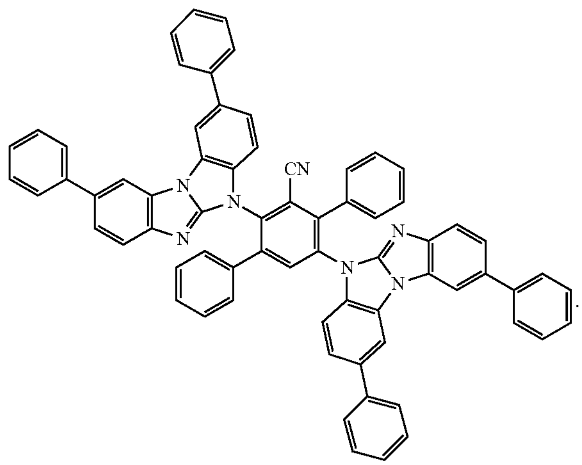

[Hole Transport Region 12]

In the organic light-emitting device 10, the hole transporting region 12 may be arranged between the first electrode 11 and the emission layer 15.

The hole transport region 12 may have a single-layered structure or a multi-layered structure.

For example, the hole transport region 12 may have a hole injection layer structure, a hole transport layer structure, a hole injection layer/hole transport layer structure, a hole injection layer/first hole transport layer/second hole transport layer structure, a hole transport layer/interlayer structure, a hole injection layer/hole transport layer/interlayer structure, a hole transport layer/electron blocking layer structure, or a hole injection layer/hole transport layer/electron blocking layer structure, but embodiments of the present disclosure are not limited thereto.

The hole transport region 12 may include any compound having hole-transporting properties.

For example, the hole transport region 12 may include an amine-based compound.

In an embodiment, the hole transport region 12 may include at least one compound represented by Formulae 201 to 205, but embodiments of the present disclosure are not limited thereto:

Formula 201

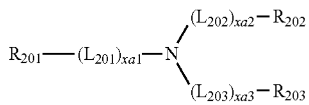

Formula 202

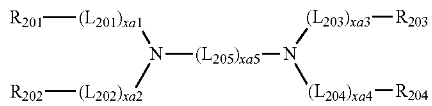

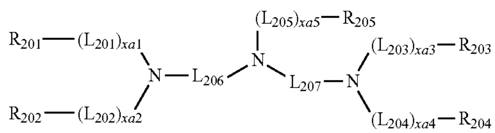

Formula 204

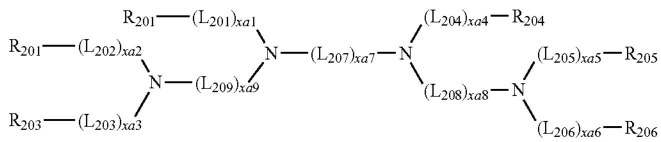

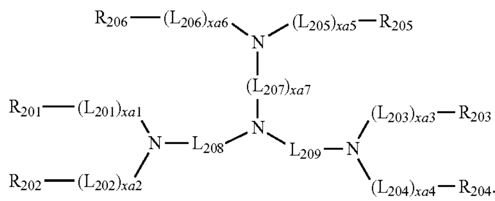

In Formulae 201 to 205, $L_{201}$ to $L_{209}$ may each independently *-be O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_6$ heteroaryl group, a substituted or unsubstituted monovalent aromatic condensed polycyclic group, a substituted or unsubstituted monovalent aromatic condensed heteropolycyclic group, a substituted or unsubstituted monovalent non-aromatic condensed polycyclic group, or a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

For example, $L_{201}$ to $L_{209}$ may each independently be a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentacene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with at least one deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —$Si(Q_{11})(Q_{12})(Q_{13})$, or any combination thereof, xa1 to xa9 may each independently be 0, 1, or 2, $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof, and $Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, the hole transport region 12 may include a carbazole-containing amine-based compound.

In one or more embodiments, the hole transport region 12 may include a carbazole-containing amine-based compound and a carbazole-free amine-based compound.

The carbazole-containing amine-based compound may be, for example, a compound represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

The carbazole-free amine-based compound may be, for example, a compound represented by Formula 201 which does not include a carbazole group and which includes at least one of a dibenzofuran group, a dibenzothiophene group, a fluorene group, a spiro-bifluorene group, an indenocarbazole group, an indolocarbazole group, a benzofurocarbazole group, a benzothienocarbazole group, or any combination thereof.

In one or more embodiments, the hole transport region 12 may include at least one compound represented by Formulae 201 or 202.

In an embodiment, the hole transport region 12 may include at least one compound represented by Formulae 201-1, 202-1, or 201-2, but embodiments of the present disclosure are not limited thereto:

Formula 201-1

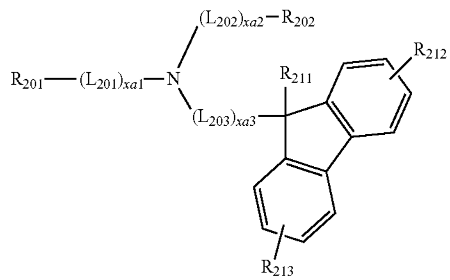

Formula 202-1

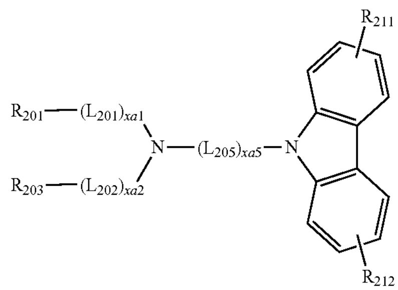

-continued

Formula 201-2

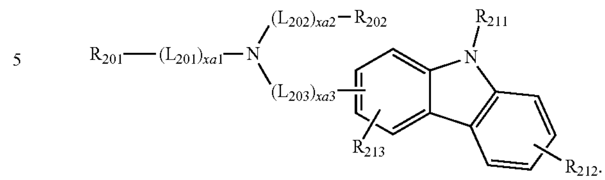

In Formulae 201-1, 202-1, and 201-2, $L_{201}$ to $L_{203}$, $L_{205}$, xa1 to xa3, xa5, $R_{201}$ and $R_{202}$ may respectively be the same as described herein, and $R_{211}$ to $R_{213}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole transport region 12 may include at least one of Compounds HT1 to HT39, but embodiments of the present disclosure are not limited thereto:

HT1

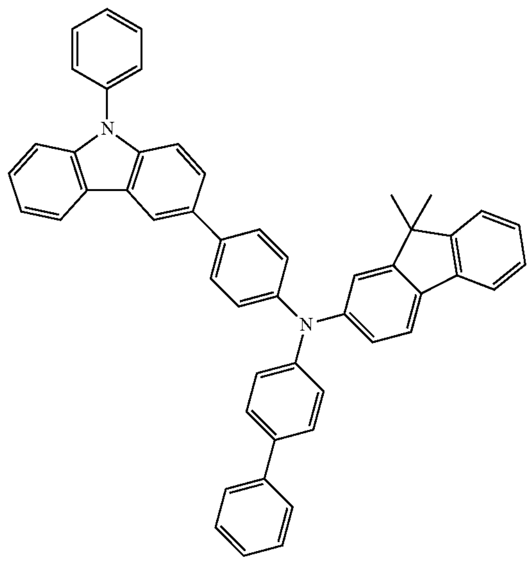

HT2

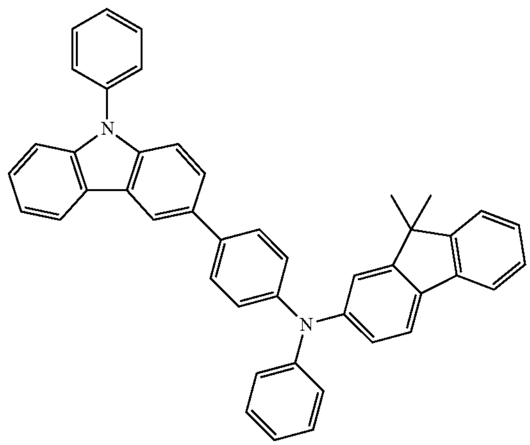

-continued
HT3
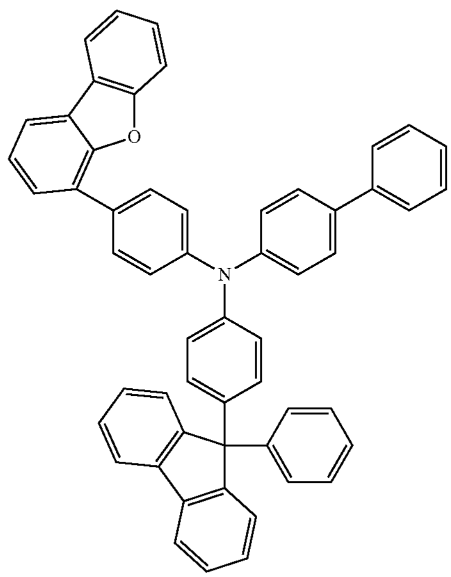
HT34
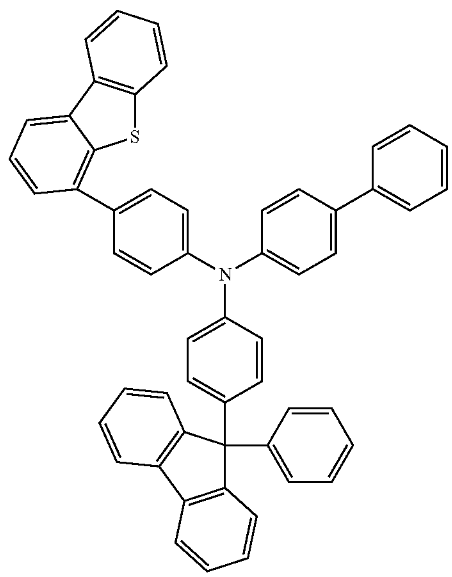
HT5
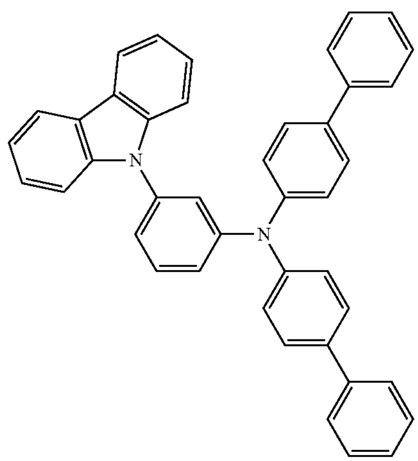
HT6
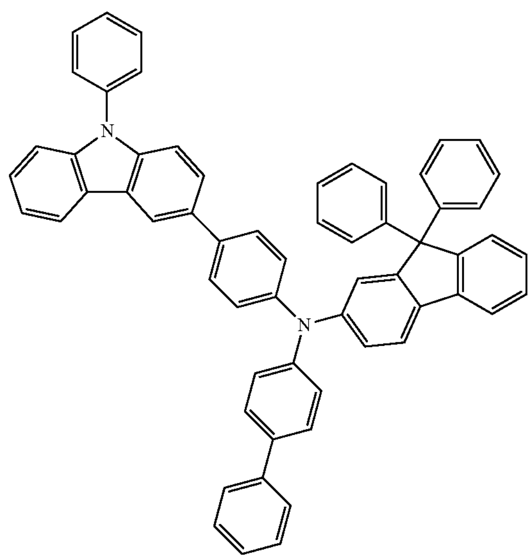

-continued
HT7
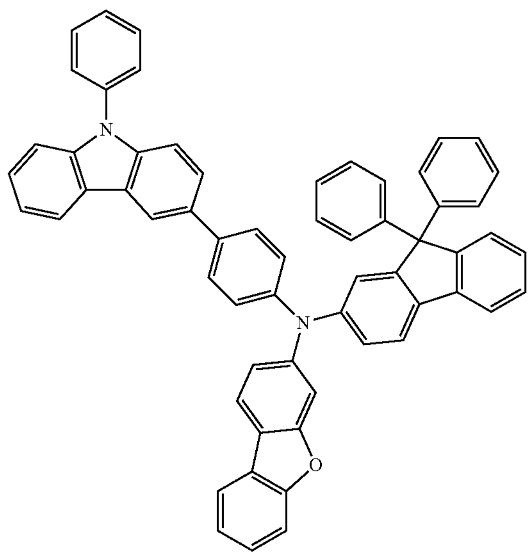
HT8
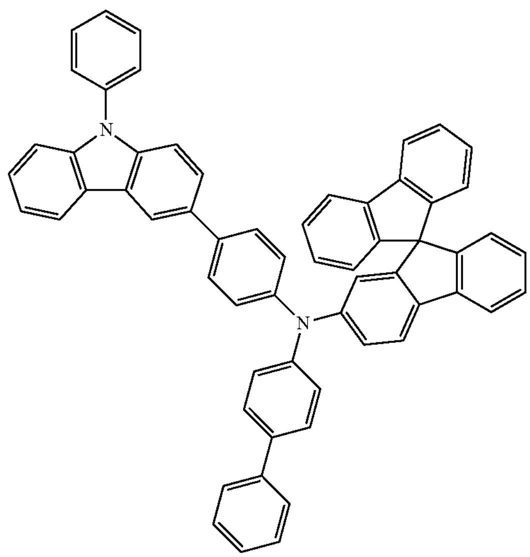
HT9
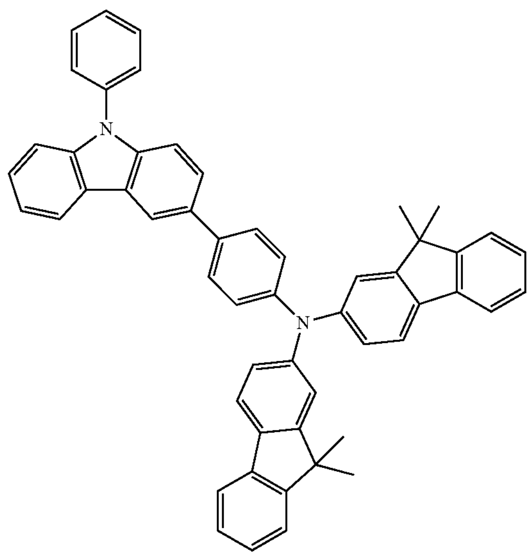
HT10
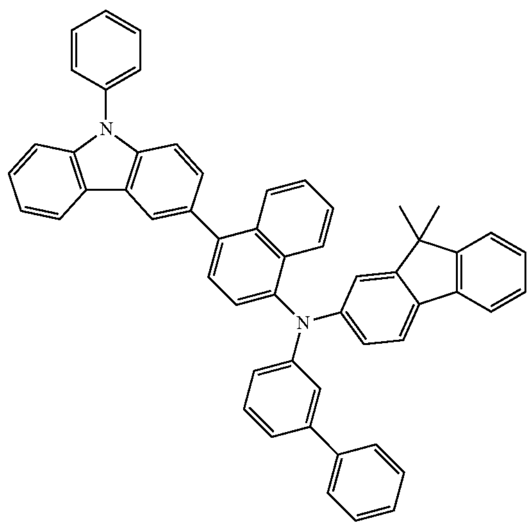
HT11
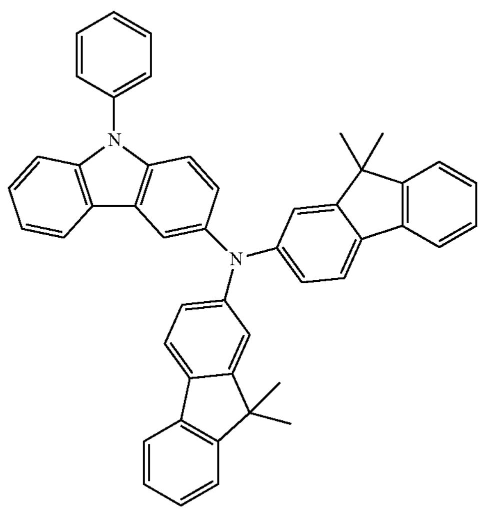
HT12
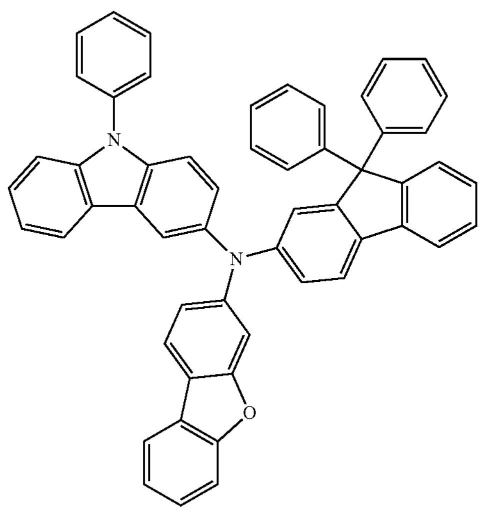

-continued
HT13
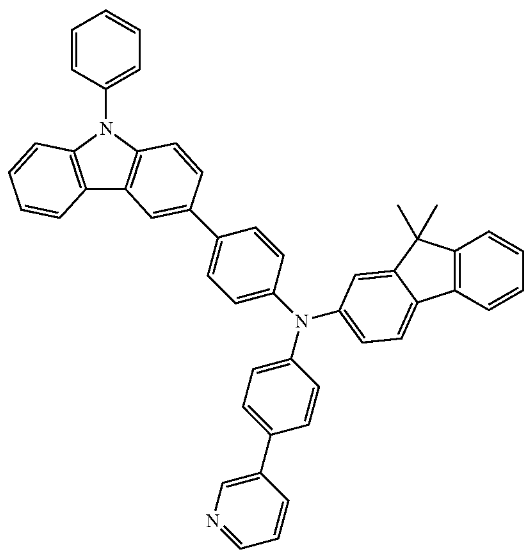
HT14
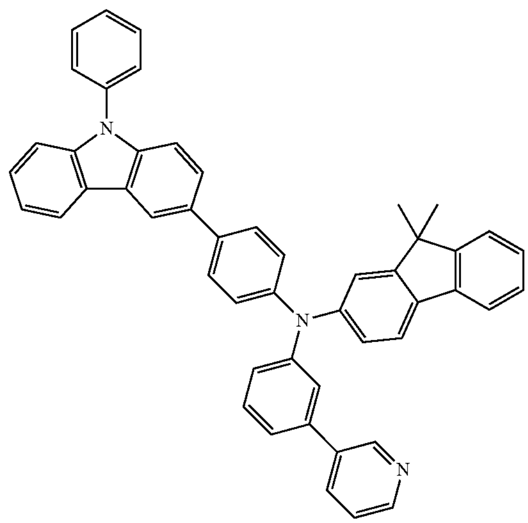
HT15
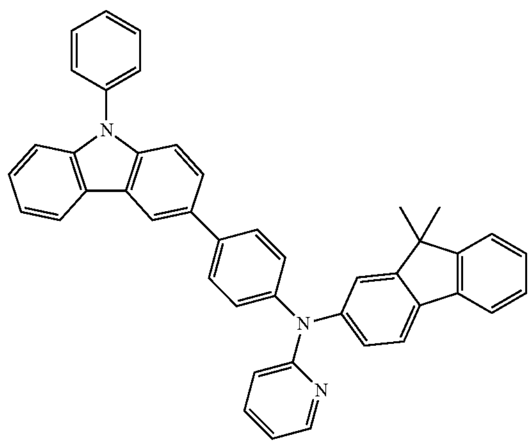
HT16
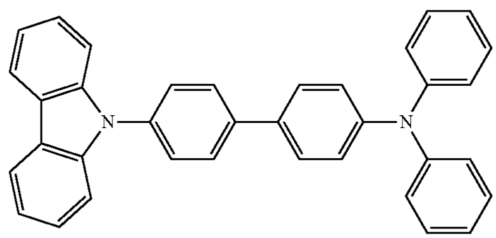
HT17
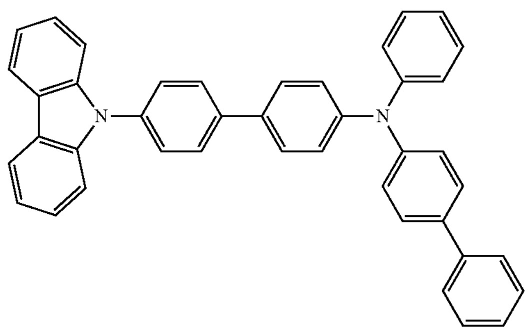
HT18
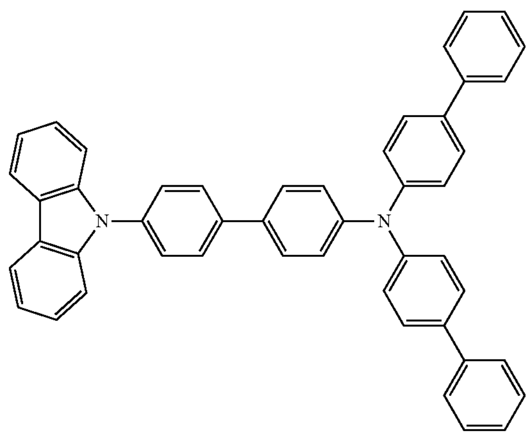

-continued
HT19
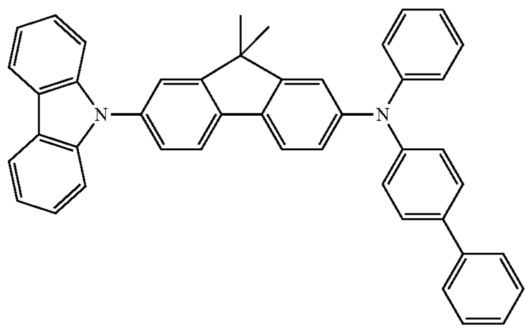
HT20
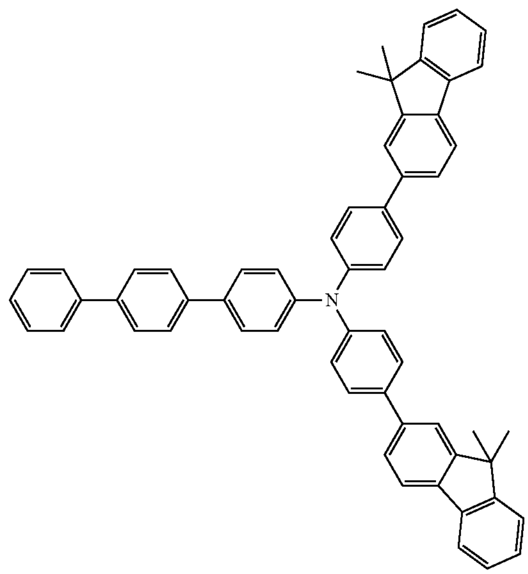
HT21
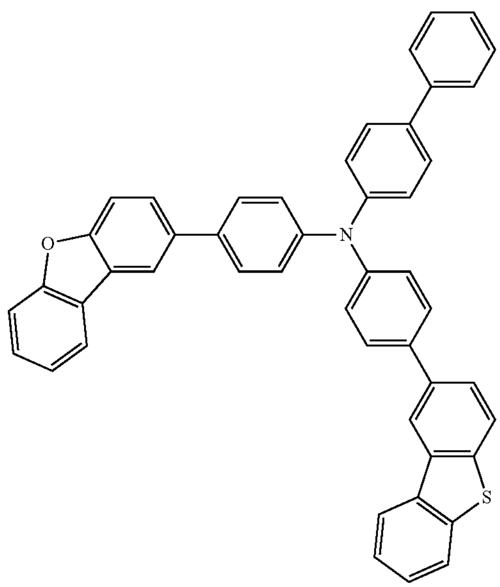
HT22
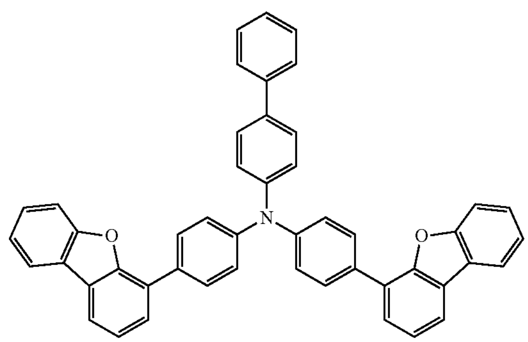
HT23
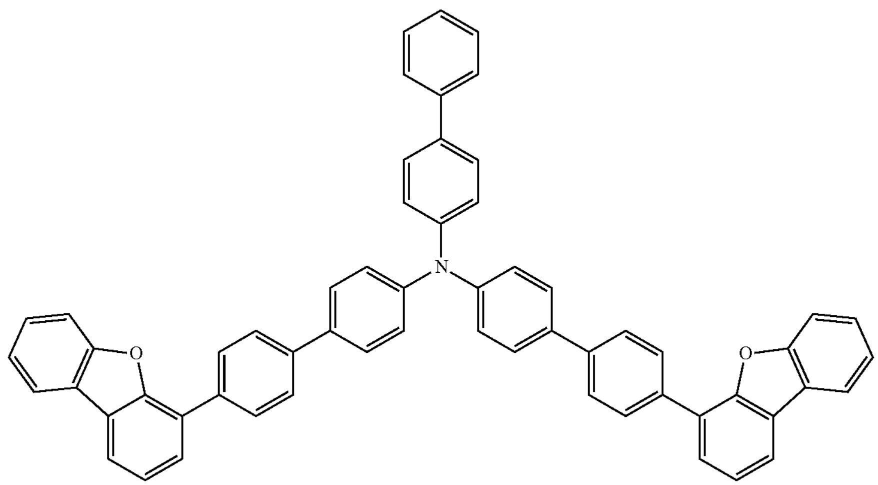

-continued
HT24
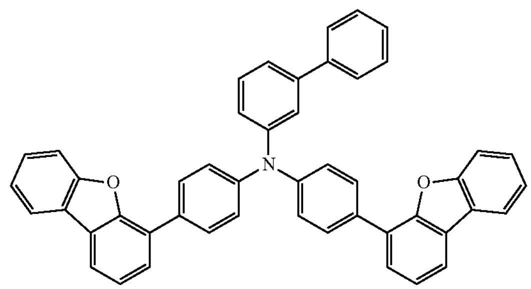
HT25
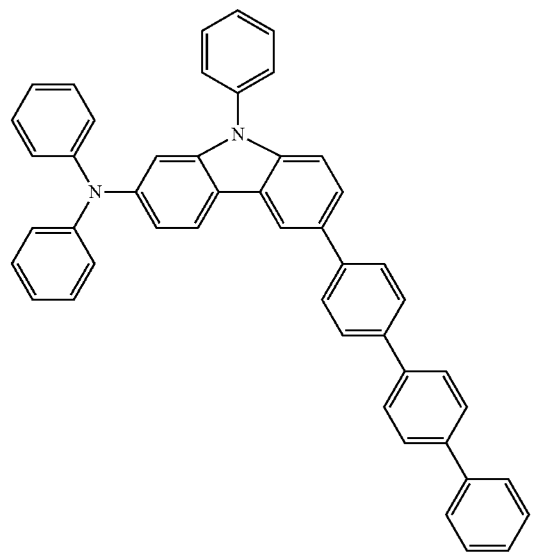
HT26
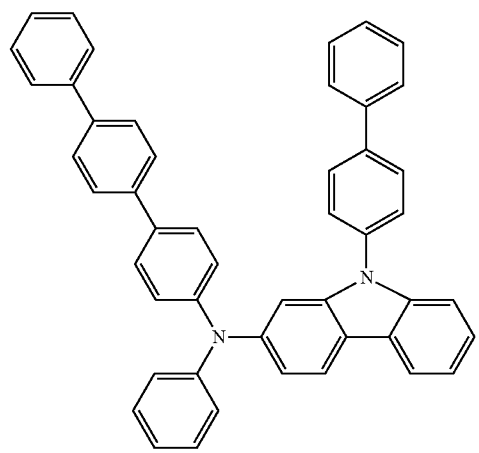
HT27
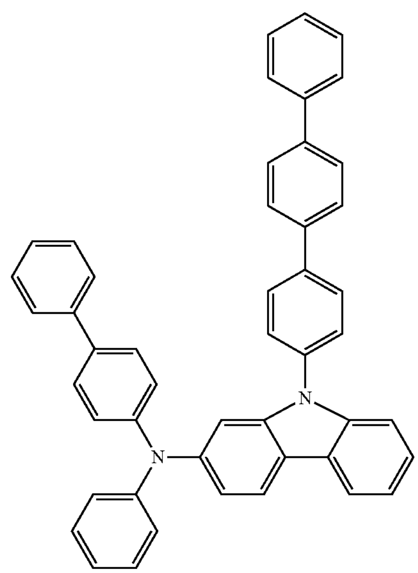
HT28
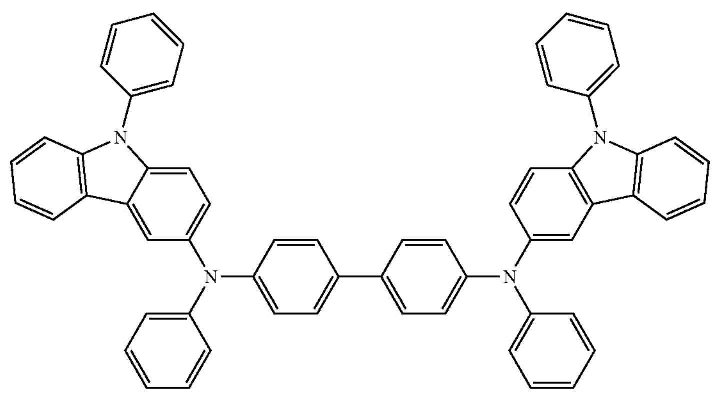

-continued
HT29
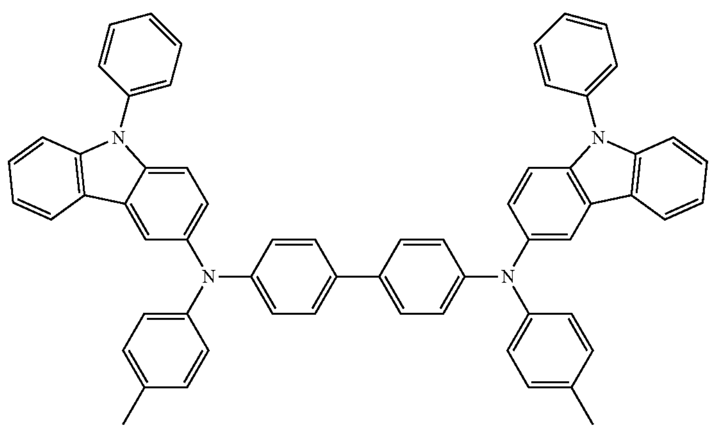
HT30
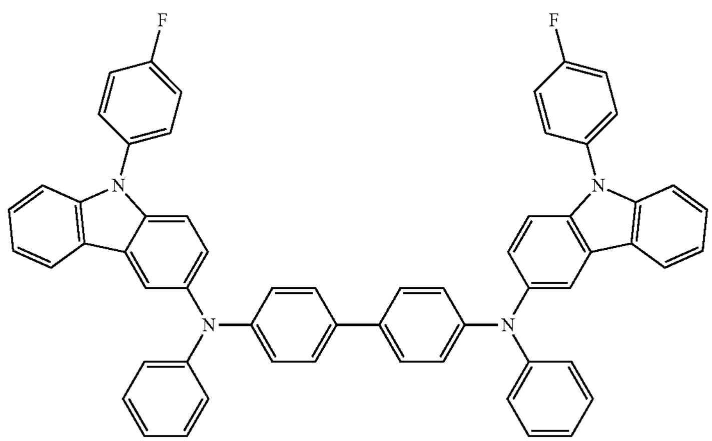
HT31
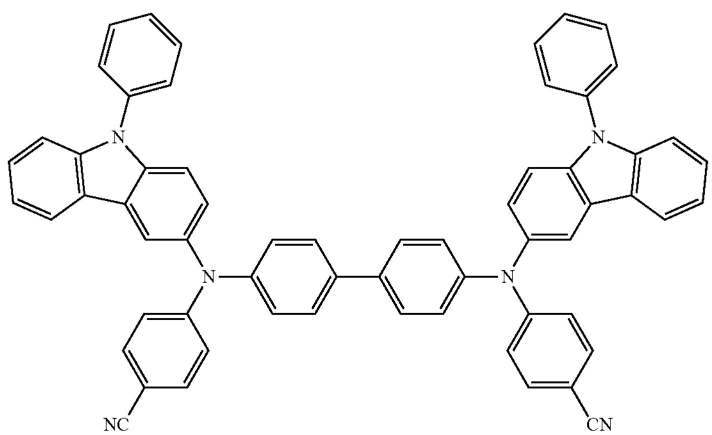

-continued
HT32
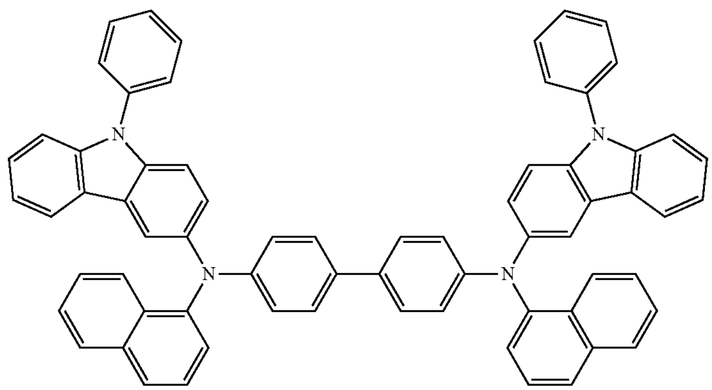
HT33
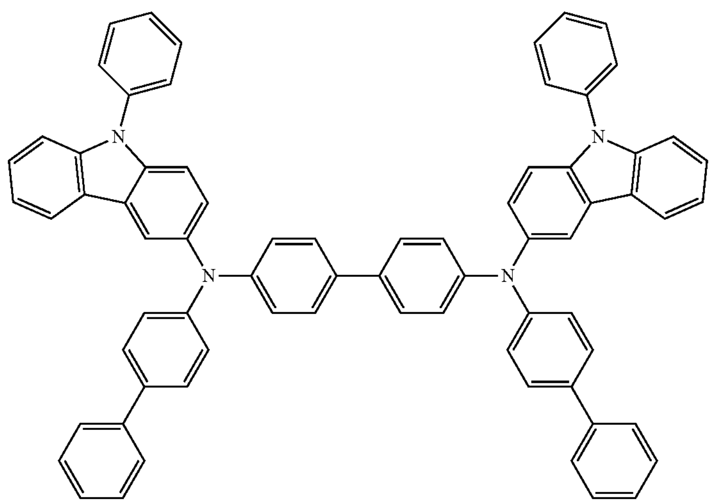
HT34
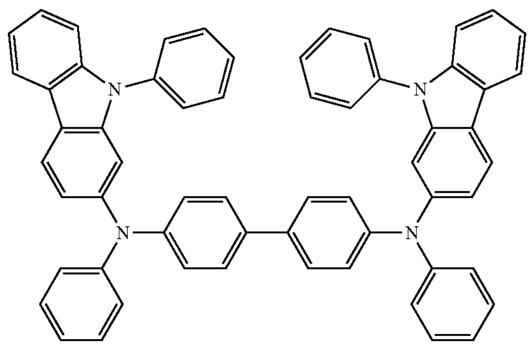
HT35
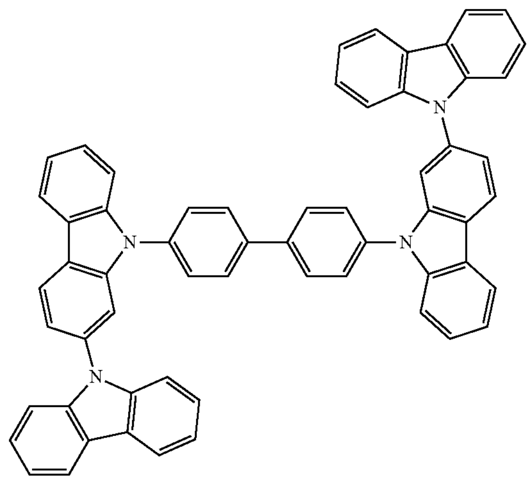

-continued
HT36
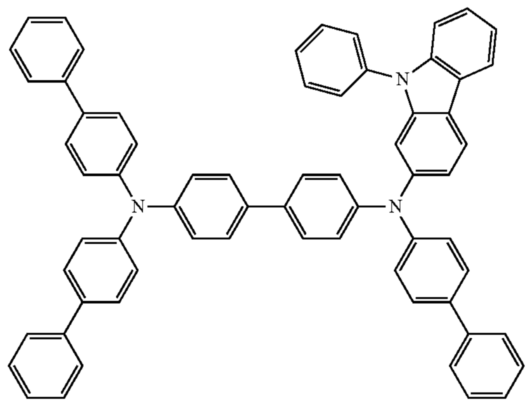
HT37
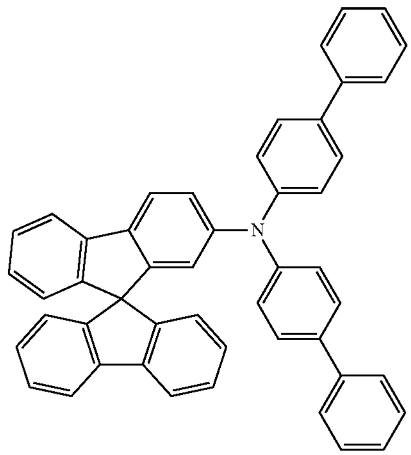
HT38
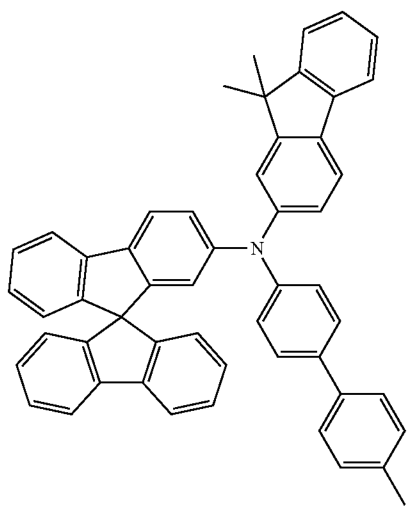
HT39
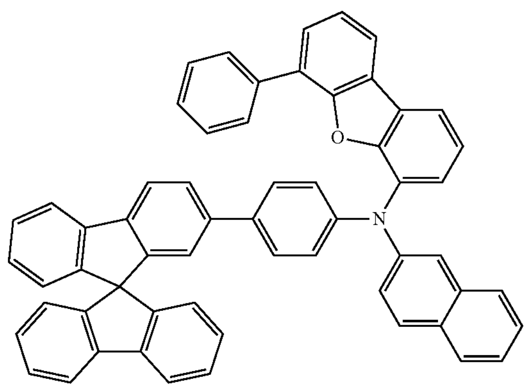
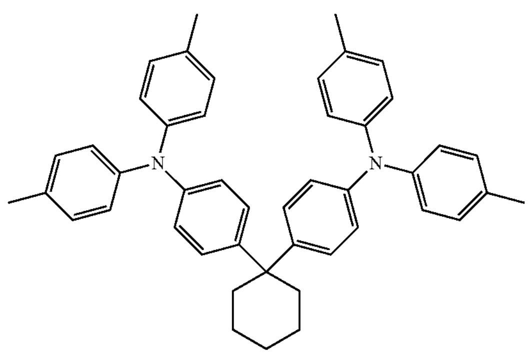
TAPC
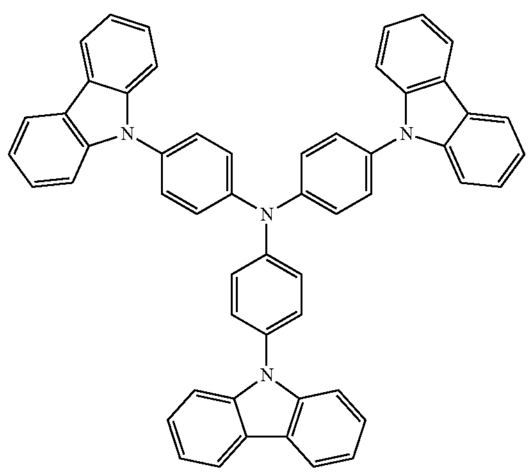
TCTA In one or more embodiments, the hole transport region 12 may include at least one of 4,4'-cyclohexylidenebis[N,N-bis(4-methylphenyl)benzenamine] (TAPC), tris(4-carbazoyl-9-ylphenyl)amine (TCTA), or any combination thereof.

In one or more embodiments, the hole transport region 12 of the organic light-emitting device 10 may further include a p-dopant. When the hole transport region 12 further includes a p-dopant, the hole transport region 12 may have a structure including a matrix (for example, at least one of compounds represented by Formulae 201 to 205) and a p-dopant included in the matrix. The p-dopant may be uniformly or non-uniformly doped in the hole transport region 12.

For example, a lowest unoccupied molecular orbital (LUMO) energy level of the p-dopant may be about −3.5 eV or less.

The p-dopant may include at least one a quinone derivative, a metal oxide, a cyano group-containing compound, or any combination thereof, but embodiments of the present disclosure are not limited thereto.

In an embodiment, the p-dopant may include at least one of:

a quinone derivative, such as tetracyanoquinodimethane (TCNQ),2,3,5,6-tetrafluoro-7,7,8,8-tetracyanoquinodimethane (F4-TCNQ), and F6-TCNNQ;

a metal oxide, such as tungsten oxide or molybdenum oxide;

1,4,5,8,9,12-hexaazatriphenylene-hexacarbonitrile (HAT-CN);

a compound represented by Formula 221, or any combination thereof, but embodiments of the present disclosure are not limited thereto:

HAT-CN

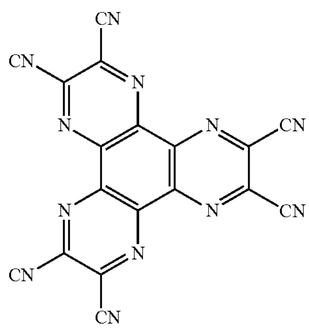

F4-TCNQ

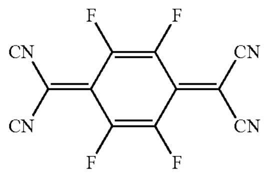

F6-TCNNQ

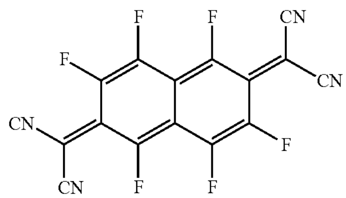

-continued

Formula 221

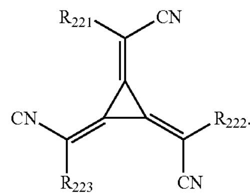

In Formula 221, $R_{221}$ to $R_{223}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent aromatic condensed polycyclic group, a substituted or unsubstituted monovalent aromatic condensed heteropolycyclic group, a substituted or unsubstituted monovalent non-aromatic condensed polycyclic group, or a substituted or unsubstituted monovalent non-aromatic condensed heteropolycyclic group, wherein at least one of $R_{221}$ to $R_{223}$ may have at least one of a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, a $C_1$-$C_{20}$ alkyl group substituted with —I, or any combination thereof.

The hole transport region 12 may have a thickness in a range of about 100 Å to about 10,000 Å, for example, about 400 Å to about 2,000 Å, and the emission layer 15 may have a thickness in a range of about 100 Å to about 3,000 Å, for example, about 300 Å to about 1,000 Å. When the thickness of each of the hole transport region 12 and the emission layer 15 is within these ranges, satisfactory hole transportation characteristics and/or luminescence characteristics may be obtained without a substantial increase in driving voltage.

[Electron Transport Region 17]

The electron transport region 17 is arranged between the emission layer 15 and the second electrode 19 of the organic light-emitting device 10.

The electron transport region 17 may have a single-layered structure or a multi-layered structure.

For example, the electron transport region 17 may have an electron transport layer structure, an electron transport layer/electron injection layer structure, a buffer layer/electron transport layer structure, hole blocking layer/electron transport layer structure, a buffer layer/electron transport layer/electron injection layer structure, or a hole blocking layer/electron transport layer/electron injection layer structure, but embodiments of the present disclosure are not limited thereto. The electron transport region 17 may further include an electron control layer.

The electron transport region 17 may include a known electron-transporting material.

The electron transport region 17 (for example, a buffer layer, a hole blocking layer, an electron control layer, or an electron transport layer in the electron transport region) may include a metal-free compound containing at least one π electron-depleted nitrogen-containing cyclic group. The π electron-depleted nitrogen-containing cyclic group may be the same as described above.

In an embodiment, the electron transport region 17 may include a compound represented by Formula 601:

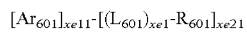

$[Ar_{601}]_{xe11}$-$[(L_{601})_{xe1}$-$R_{601}]_{xe21}$ Formula 601 wherein, in Formula 601, $Ar_{601}$ and $L_{601}$ may each independently be a substituted or unsubstituted $C_5$-$C_{60}$ carbocyclic group or a substituted or unsubstituted $C_1$-$C_{60}$ heterocyclic group, xe11 may be 1, 2, or 3, xe1 may be an integer from 0 to 5, $R_{601}$ may be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent aromatic condensed polycyclic group, a substituted or unsubstituted monovalent non-aromatic condensed polycyclic group, a substituted or unsubstituted monovalent aromatic condensed heteropolycyclic group, a substituted or unsubstituted monovalent non-aromatic condensed heteropolycyclic group, —$Si(Q_{601})(Q_{602})(Q_{603})$, —$C(=O)(Q_{601})$, —$S(=O)_2(Q_{601})$, or —$P(=O)(Q_{601})(Q_{602})$, $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-depleted nitrogen-containing cyclic group.

In an embodiment, $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —$Si(Q_{31})(Q_{32})(Q_{33})$, —$S(=O)_2(Q_{31})$, —$P(=O)(Q_{31})(Q_{32})$, or any combination thereof, and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$ may be linked together via a single bond.

In one or more embodiments, $Ar_{601}$ in Formula 601 may be an anthracene group.

In one or more embodiments, the compound represented by Formula 601 may be represented by Formula 601-1:

Formula 601-1

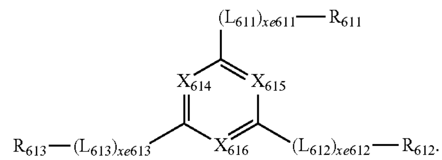

In Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each independently be the same as described in connection with $L_{601}$, xe611 to xe613 may each independently be the same as described in connection with xe1, $R_{611}$ to $R_{613}$ may each independently be the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with at least one deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof, and —$S(=O)_2(Q_{601})$ or —$P(=O)(Q_{601})(Q_{602})$, and $Q_{601}$ and $Q_{602}$ may respectively be the same as described above.

In an embodiment, the electron transport region 17 may include at least one compound of Compounds ET1 to ET36, but embodiments of the present disclosure are not limited thereto:

ET1

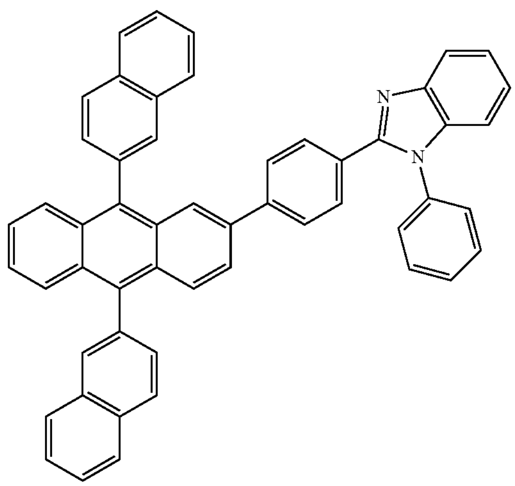

ET2

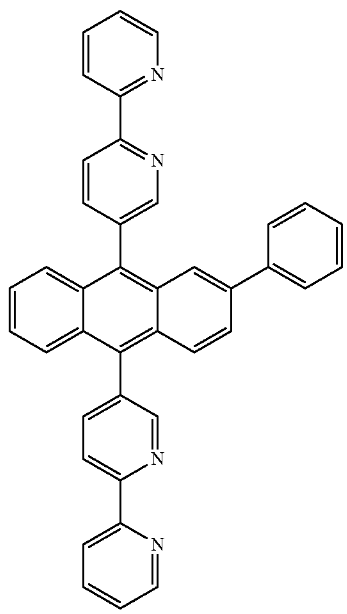

ET3

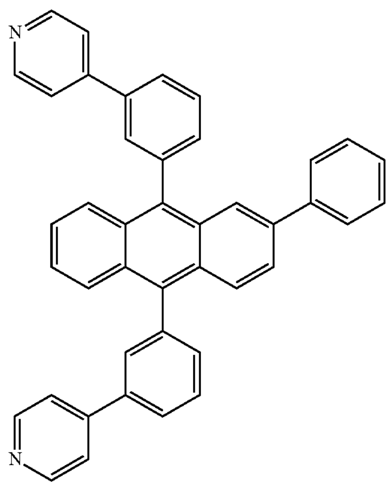

ET4

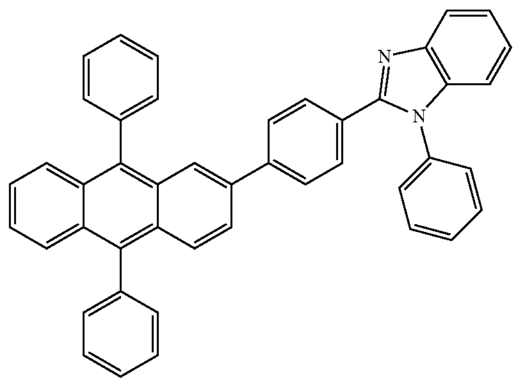

-continued
ET5
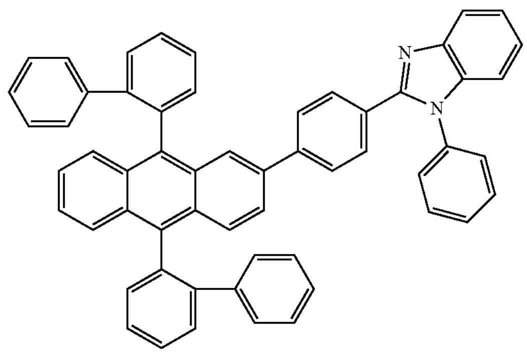
ET6
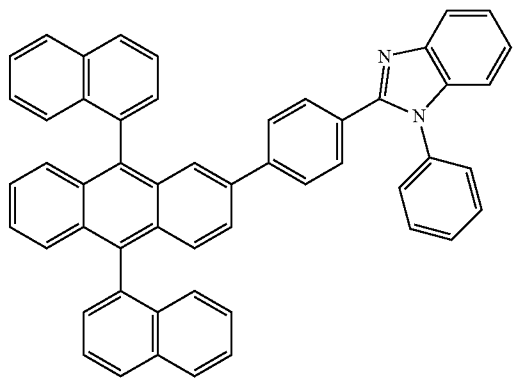
ET7
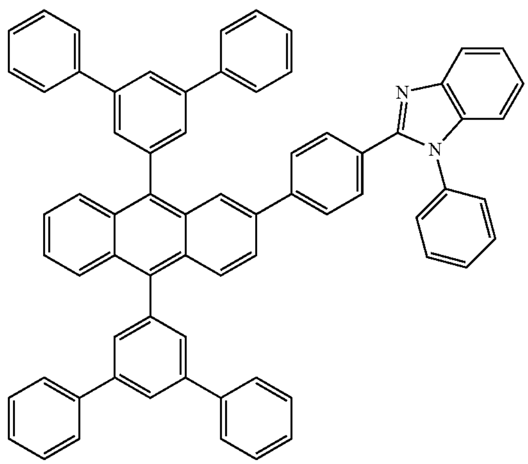
ET8
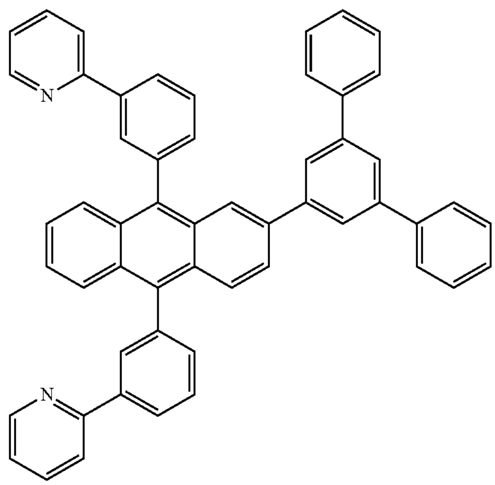
ET9
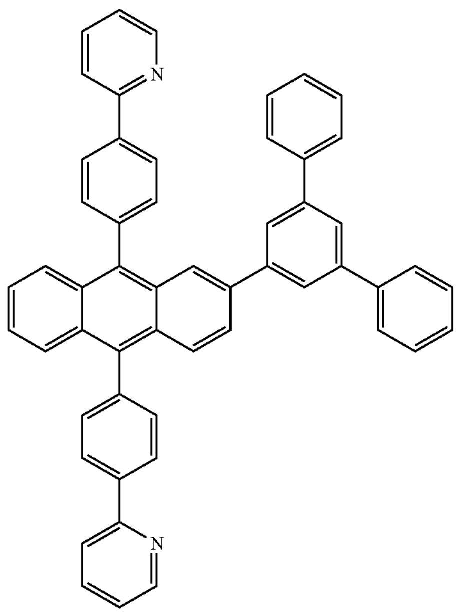
ET10
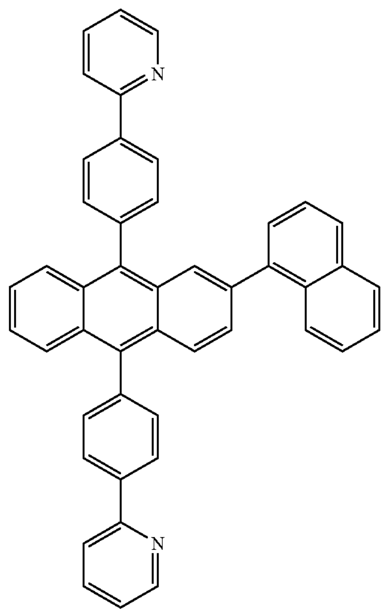

-continued
ET11
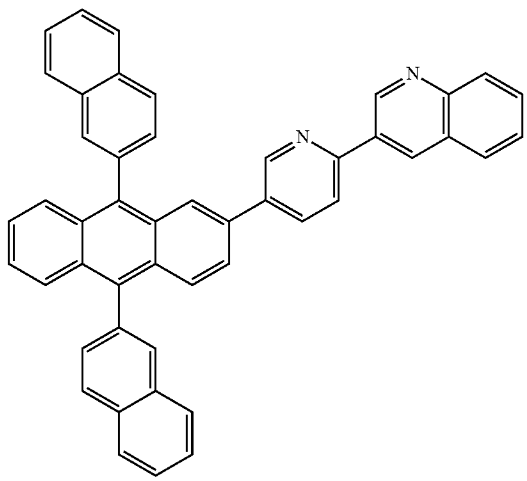
ET12
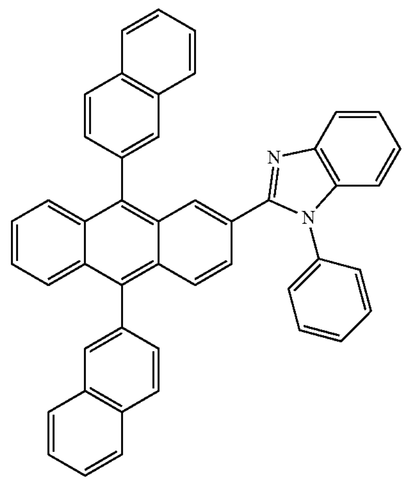
ET13
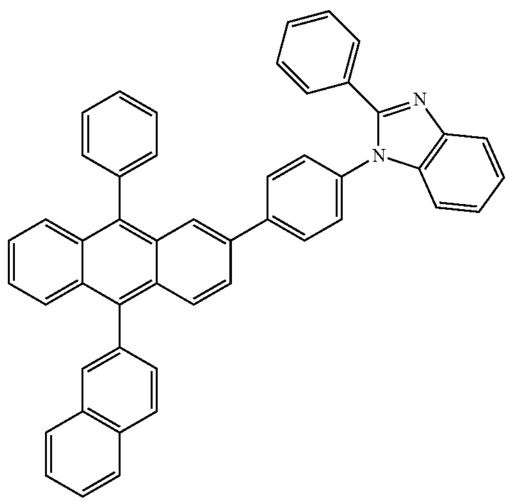
ET14
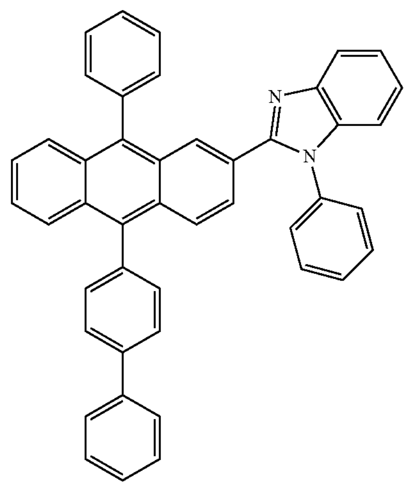
ET15
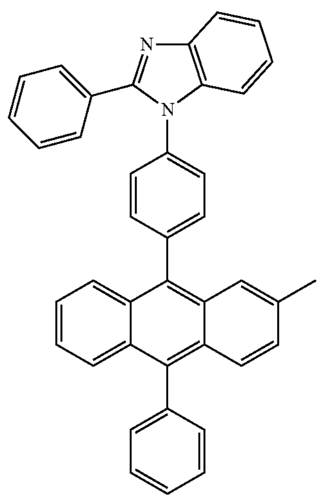
ET16
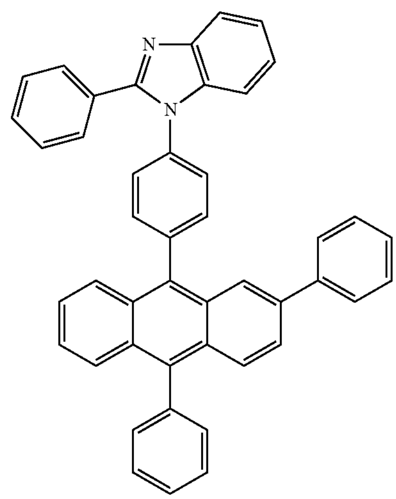

-continued
ET17
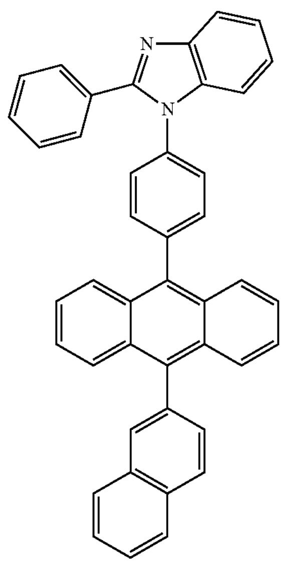
ET18
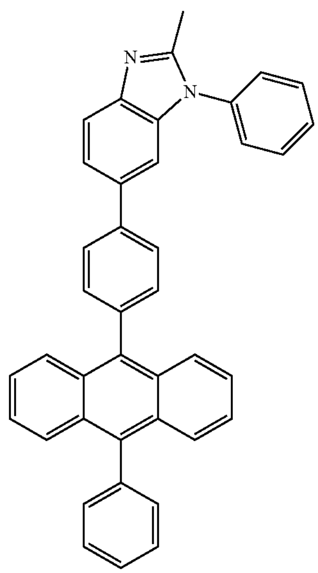
ET19
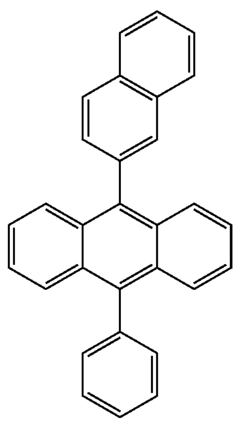
ET20
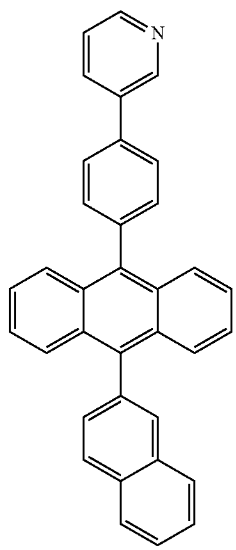
ET21
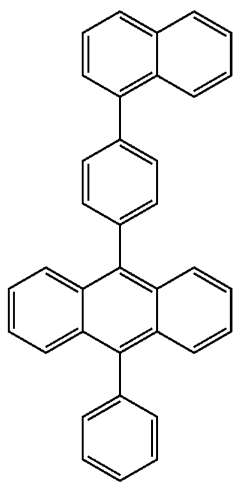
ET22
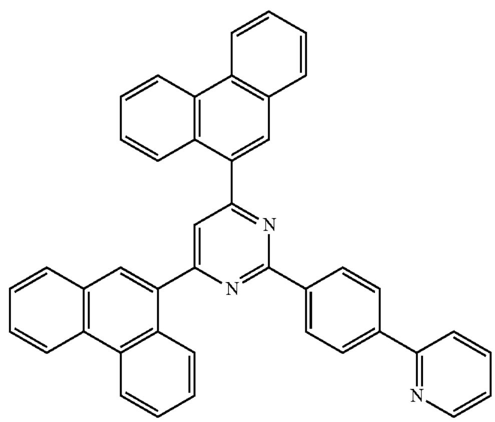

-continued
ET23
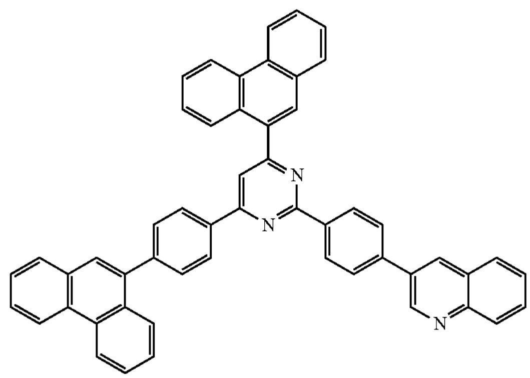
ET24
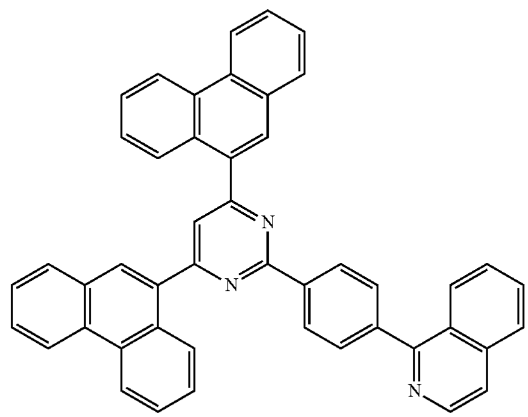
ET25
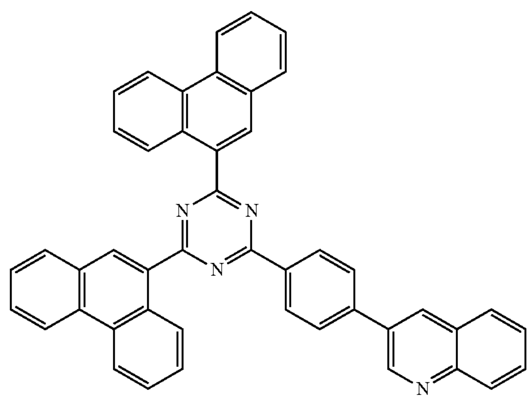
ET26
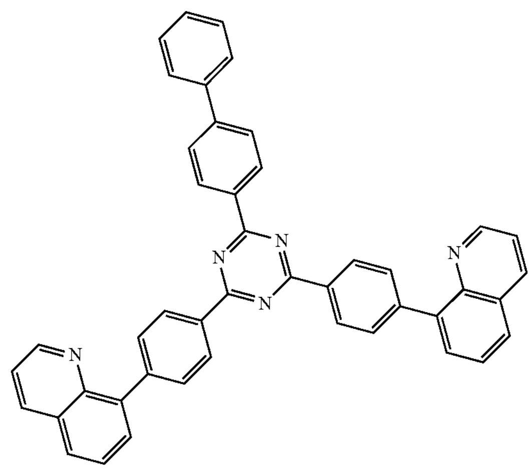
ET27
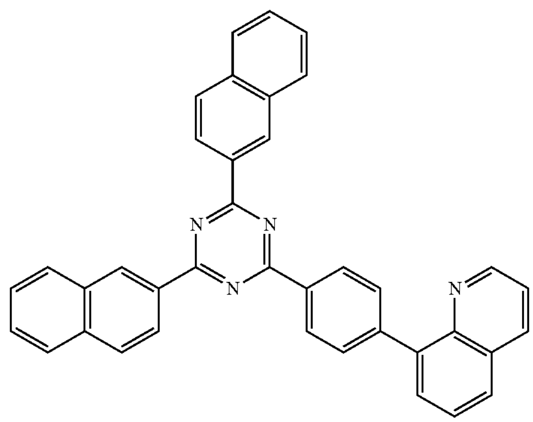

-continued
ET28
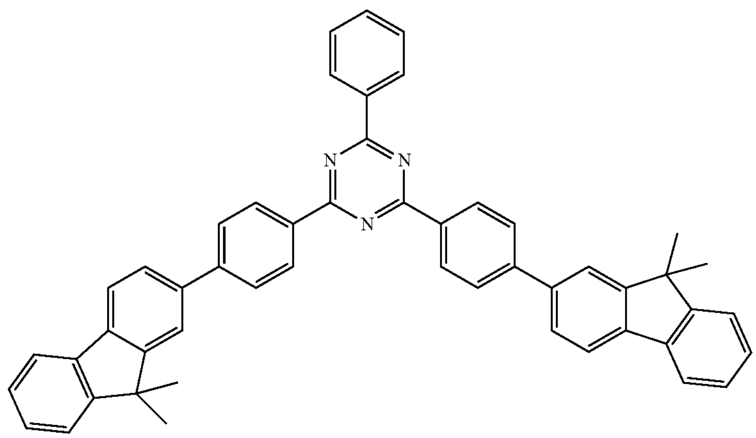
ET29
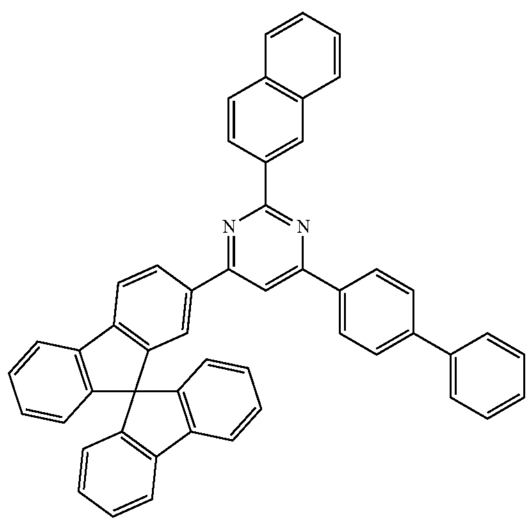
ET30
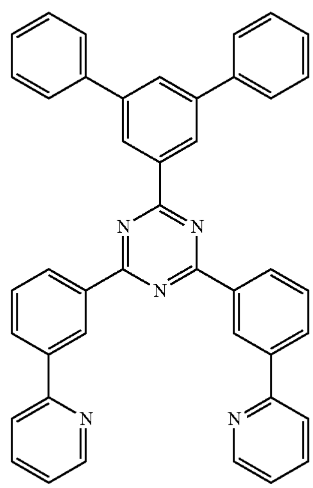
ET31
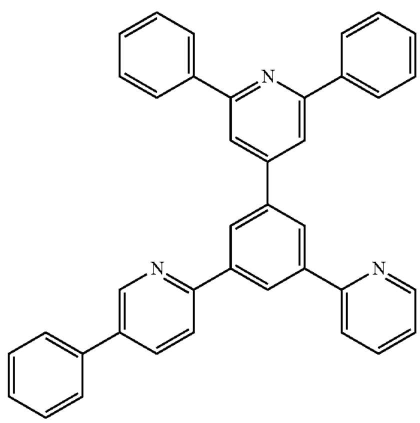
ET32
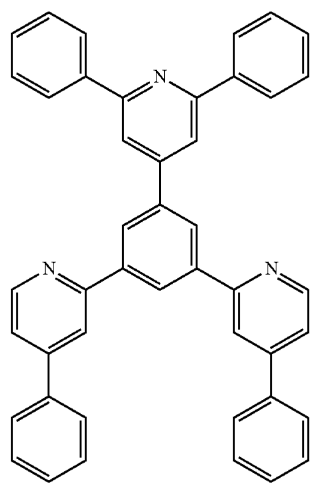

-continued
ET33
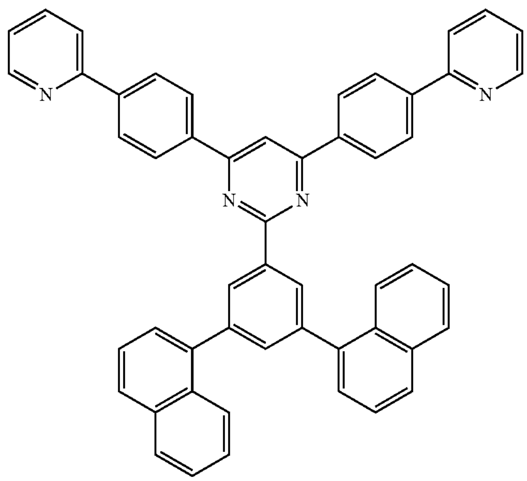
ET34
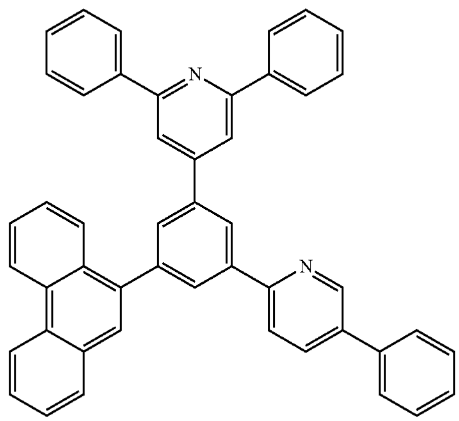
ET35
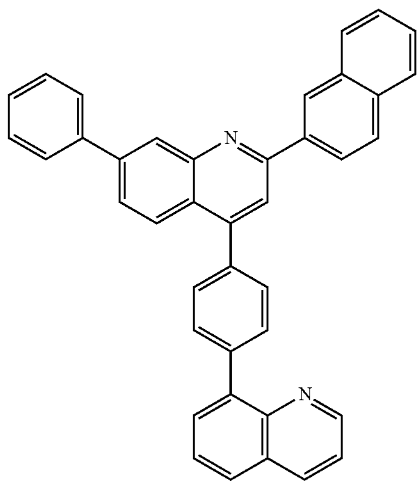
ET36
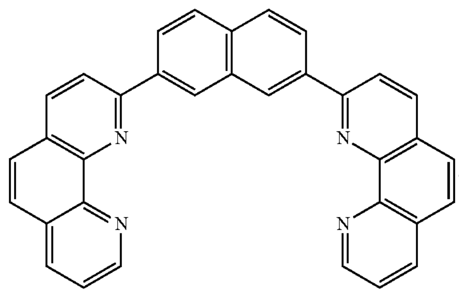
In one or more embodiments, the electron transport region 17 may include at least one compound of 2,9-dimethyl-4,7-diphenyl-1,10-phenanthroline (BCP), 4,7-diphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), 2,2',2"-(1,3,5-Benzinetriyl)-tris(1-phenyl-1-H-benzimidazole) (TPBi), NTAZ, or any combination thereof:
$Alq_3$
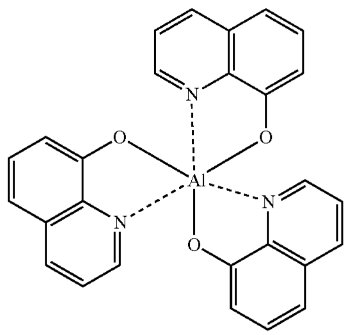
-continued
BAlq
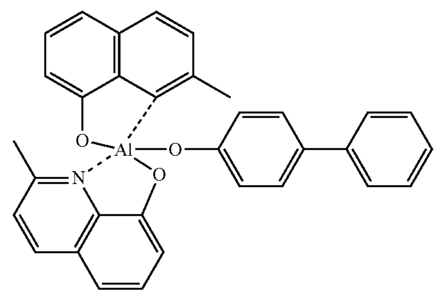
TAZ
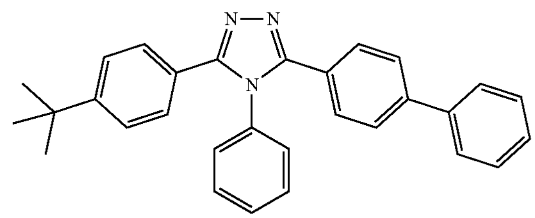

-continued

NTAZ

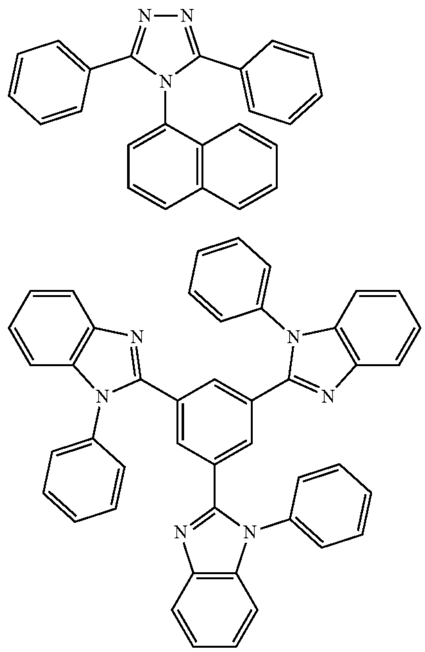

TPBi

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within these ranges, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within these ranges, satisfactory electron transporting characteristics may be obtained without a substantial increase in driving voltage.

The electron transport region 17 (for example, the electron transport layer in the electron transport region) may further include, in addition to the materials described above, a metal-containing material.

The metal-containing material may include at least one of an alkali metal complex, an alkaline earth-metal complex, or a combination thereof. The alkali metal complex may include a metal ion of a Li ion, a Na ion, a K ion, a Rb ion, a Cs ion, or any combination thereof, and the alkaline earth-metal complex may include a metal ion of a Be ion, a Mg ion, a Ca ion, a Sr ion, a Ba ion, or any combination thereof. A ligand coordinated with the metal ion of the alkali metal complex or the alkaline earth-metal complex may be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, or a cyclopentadiene, but embodiments of the present disclosure are not limited thereto.

In an embodiment, the metal-containing material may include a Li complex. The Li complex may include, for example, Compound ET-D1 (lithium quinolate (LiQ)) or ET-D2:

ET-D1

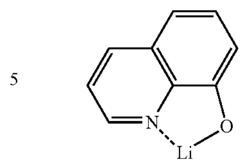

ET-D2

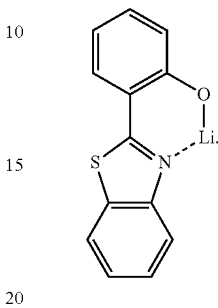

The electron transport region 17 may include an electron injection layer that facilitates the injection of electrons from the second electrode 19. The electron injection layer may directly contact the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof.

The alkali metal may be Li, Na, K, Rb, or Cs. In an embodiment, the alkali metal may be Li, Na, or Cs. In one or more embodiments, the alkali metal may be Li or Cs, but embodiments of the present disclosure are not limited thereto.

The alkaline earth metal may be Mg, Ca, Sr, or Ba.

The rare earth metal may be Sc, Y, Ce, Tb, Yb, or Gd.

The alkali metal compound, the alkaline earth-metal compound, and the rare earth metal compound may be an oxide or a halide (for example, fluorides, chlorides, bromides, or iodides) of the alkali metal, the alkaline earth-metal, or the rare earth metal.

The alkali metal compound may be an alkali metal oxide, such as $Li_2O$, $Cs_2O$, or $K_2O$, or alkali metal halides, such as LiF, NaF, CsF, KF, LiI, NaI, CsI, or KI. In an embodiment, the alkali metal compound may be LiF, $Li_2O$, NaF, LiI, NaI, CsI, or KI, but embodiments of the present disclosure are not limited thereto.

The alkaline earth-metal compound may be an alkaline earth-metal oxide, such as BaO, SrO, CaO, $Ba_xSr_{1-x}O$ ($0<x<1$), or $Ba_xCa_{1-x}O$ ($0<x<1$). In an embodiment, the alkaline earth-metal compound may be BaO, SrO, or CaO, but embodiments of the present disclosure are not limited thereto.

The rare earth metal compound may be $YbF_3$, $ScF_3$, $ScO_3$, $Y_2O_3$, $Ce_2O_3$, $GdF_3$, or $TbF_3$. In an embodiment, the rare earth metal compound may be $YbF_3$, $ScF_3$, $TbF_3$, $YbI_3$, $ScI_3$, or $TbI_3$, but embodiments of the present disclosure are not limited thereto.

The alkali metal complex, the alkaline earth-metal complex, and the rare earth metal complex may include an ion of an alkali metal, an alkaline earth-metal, or a rare earth metal as described above, and a ligand coordinated with a metal ion of the alkali metal complex, the alkaline earth-metal complex, or the rare earth metal complex may be hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, or cyclopentadiene, but embodiments of the present disclosure are not limited thereto.

The electron injection layer may comprise of an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combinations thereof, as described above. In one or more embodiments, the electron injection layer may further include an organic material. When the electron injection layer further includes an organic material, an alkali metal, an alkaline earth metal, a rare earth metal, an alkali metal compound, an alkaline earth-metal compound, a rare earth metal compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

[Second Electrode 19]

The second electrode 19 is arranged on the organic layer 10A having such a structure. The second electrode 19 may be a cathode which is an electron injection electrode, and in this regard, a material for forming the second electrode 19 may be a metal, an alloy, an electrically conductive compound, or a combination thereof, which have a relatively low work function.

The second electrode 19 may include at least one lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof, but embodiments of the present disclosure are not limited thereto. The second electrode 19 may be a transmissive electrode, a semi-transmissive electrode, or a reflective electrode.

The second electrode 19 may have a single-layered structure having a single layer or a multi-layered structure including two or more layers.

Hereinbefore, the organic light-emitting device has been described with reference to FIG. 1, but embodiments of the present disclosure are not limited thereto.

Figure 2:
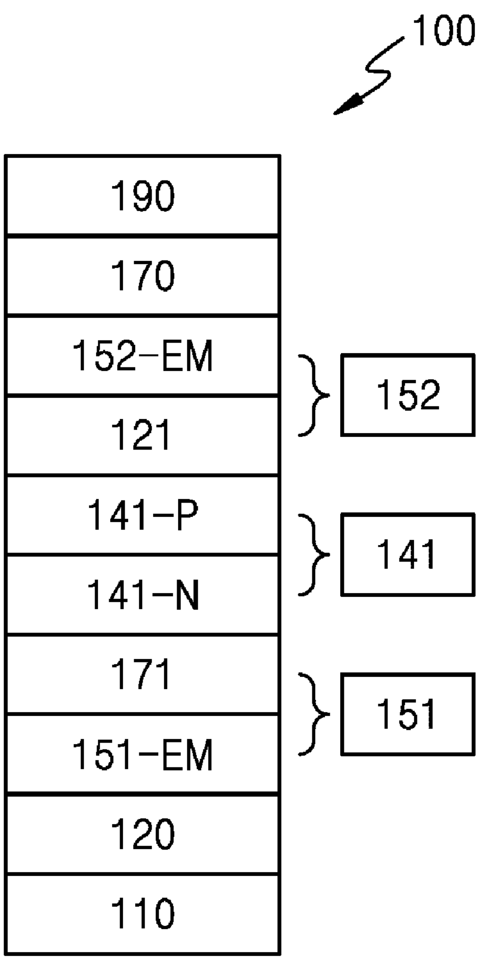
FIG. 2 is a schematic cross-sectional view of an organic light-emitting device according to another exemplary embodiment.

Description of FIG. 2

FIG. 2 is a schematic cross-sectional view of an organic light-emitting device 100 according to another exemplary embodiment.

The organic light-emitting device 100 of FIG. 2 includes a first electrode 110, a second electrode 190 facing the first electrode 110, and a first emitting unit 151 and a second emitting unit 152 between the first electrode 110 and the second electrode 190. A charge generation layer 141 is arranged between the first emitting unit 151 and the second emitting unit 152, and the charge generation layer 141 may include an n-type charge generation layer 141-N and a p-type charge generation layer 141-P. The charge generation layer 141 is a layer that generates a charge and supplies the charge to neighboring emitting units, and any known material may be used therefor.

The first emitting unit 151 may include a first emission layer 151-EM, and the second emitting unit 152 may include a second emission layer 152-EM. A maximum emission wavelength of light emitted from the first emitting unit 151 may be different from a maximum emission wavelength of light emitted from the second emitting unit 152. For example, the mixed light including the light emitted from the first emitting unit 151 and the light emitted from the second emitting unit 152 may be white light, but embodiments of the present disclosure are not limited thereto.

The hole transport region 120 is arranged between the first emitting unit 151 and the first electrode 110, and the second emitting unit 152 may include a first hole transport region 121 arranged on the side of the first electrode 110.

An electron transport region 170 is arranged between the second emitting unit 152 and the second electrode 190, and the first emitting unit 151 may include a first electron transport region 171 arranged between the charge generation layer 141 and the first emission layer 151-EM.

The first emission layer 151-EM may include the heterocyclic compound.

The second emission layer 152-EM may include the heterocyclic compound.

The first electrode 110 and the second electrode 190 illustrated in FIG. 2 may be the same as described in connection with the first electrode 11 and the second electrode 19 illustrated in FIG. 1.

The first emission layer 151-EM and the second emission layer 152-EM illustrated in FIG. 2 may each be the same as described in connection with the emission layer 15 illustrated in FIG. 1.

The hole transport region 120 and the first hole transport region 121 illustrated in FIG. 2 may each be the same as described in connection with the hole transport region 12 illustrated in FIG. 1.

The electron transport region 170 and the first electron transport region 171 illustrated in FIG. 2 may each be the same as described in connection with the electron transport region 17 illustrated in FIG. 1.

As described above, referring to FIG. 2, the organic light-emitting device in which each of the first emitting unit 151 and the second emitting unit 152 includes the emission layer including the host, the dopant, and the sensitizer, has been described. However, the organic light-emitting device may have various other forms. For example, one of the first emitting unit 151 and the second emitting unit 152 of the organic light-emitting device 100 of FIG. 2 may be replaced with any known emitting unit, or may include three or more emitting units.

Figure 3:
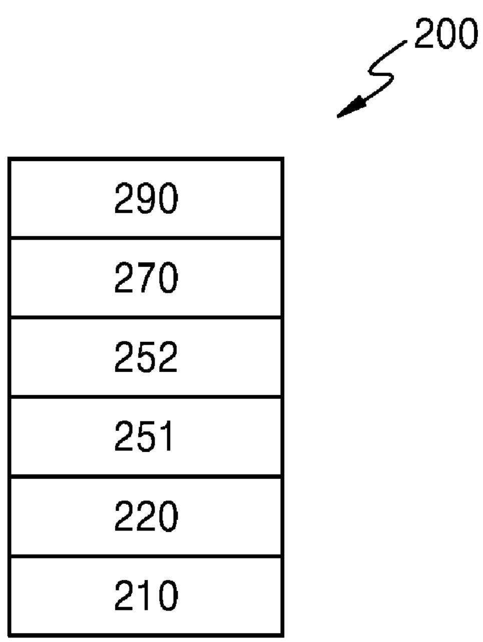
FIG. 3 is a schematic cross-sectional view of an organic light-emitting device according to another exemplary embodiment.

[Description of FIG. 3]

FIG. 3 is a schematic cross-sectional view of an organic light-emitting device 200 according to another exemplary embodiment.

The organic light-emitting device 200 includes a first electrode 210, a second electrode 290 facing the first electrode 210, and a first emission layer 251 and a second emission layer 252 which are stacked between the first electrode 210 and the second electrode 290.

A maximum emission wavelength of light emitted from the first emission layer 251 may be different from a maximum emission wavelength of light emitted from the second emission layer 252. For example, the mixed light of the light emitted from the first emission layer 251 and the light emitted from the second emission layer 252 may be white light, but embodiments of the present disclosure are not limited thereto.

In an embodiment, a hole transport region 220 may be arranged between the first emission layer 251 and the first electrode 210, and an electron transport region 270 may be arranged between the second emission layer 252 and the second electrode 290.

The first emission layer 251 may include the heterocyclic compound.

The second emission layer 252 may include the heterocyclic compound.

The first electrode 210, the hole transport region 220, and the second electrode 290 illustrated in FIG. 3 may each be the same as described in connection with the first electrode 11, the hole transport region 12, and the second electrode 19 illustrated in FIG. 1.

The first emission layer 251 and the second emission layer 252 illustrated in FIG. 3 may each be the same as described in connection with the emission layer 15 illustrated in FIG. 1.

The electron transport region 270 illustrated in FIG. 3 may be the same as described in connection with the electron transport region 17 illustrated in FIG. 1.

As described above, referring to FIG. 3, the organic light-emitting device in which both the first emission layer 251 and the second emission layer 252 include the heterocyclic compound has been described. However, any one of the two emission layers 251 and 252 in the organic light-emitting device may be replaced with a known layer, the organic light-emitting device may include three or more emission layers, or the organic light-emitting device may further include an interlayer arranged between neighboring emission layers. As such, various modifications of the organic light-emitting device may be provided.

Electronic Apparatus

The organic light-emitting device may be included in various electronic apparatuses.

The electronic apparatus may further include a thin-film transistor in addition to the organic light-emitting device as described above. The thin-film transistor may include a source electrode, a drain electrode, and an activation layer, wherein any one of the source electrode and the drain electrode may be electrically connected to any one of the first electrode and the second electrode of the organic light-emitting device.

Explanation of Terms

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof are a methoxy group, an ethoxy group, an isopropyloxy group, and the like.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof are an ethenyl group, a propenyl group, a butenyl group, and the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof are an ethynyl group, a propynyl group, and the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof are a cyclopropyl group, a cyclobutyl group, a cyclopentyl group, a cyclohexyl group, a cycloheptyl group, and the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom of N, O, P, Si, S, B, Se, Ge, Te or a combination thereof as a ring-forming atom and 1 to 10 carbon atoms, and examples thereof are a tetrahydrofuranyl group, a tetrahydrothiophenyl group, and the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof are a cyclopentenyl group, a cyclohexenyl group, a cycloheptenyl group, and the like. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, S, B, Se, Ge, Te or a combination thereof as a ring-forming atom, 1 to 10 carbon atoms, and at least one carbon-carbon double bond in its ring. Examples of the $C_1$-$C_{10}$ heterocycloalkenyl group are a 2,3-dihydrofuranyl group, a 2,3-dihydrothiophenyl group, and the like. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, a chrysenyl group, and the like. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocarbocyclic aromatic system that has at least one heteroatom N, O, P, Si, and S as a ring-forming atom, and 1 to 60 carbon atoms. The term "$C_1$-$C_{60}$ heteroarylene group" as used herein refers to a divalent group having a carbocyclic aromatic system that has at least one heteroatom N, O, P, S, B, Se, Ge, Te, or a combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, an isoquinolinyl group, and the like. When the $C_6$-$C_{60}$ heteroaryl group and the $C_6$-$C_{60}$ heteroarylene group each include two or more rings, the two or more rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The "($C_1$-$C_{20}$ alkyl) 'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

The term "monovalent aromatic condensed polycyclic group" as used herein refers to a monovalent group including two or more rings that are condensed with each other, including only carbon as a ring-forming atom (for example, 8 to 60 carbon atoms), and having aromaticity throughout its entire molecular structure. The term "divalent aromatic condensed polycyclic group" as used herein refers to a divalent group having the same structure as the monovalent aromatic condensed polycyclic group described above.

The term "monovalent aromatic condensed heteropolycyclic group" as used herein refers to a monovalent group having two or more rings condensed to each other, a heteroatom N, O, P, Si, S, B, Se, Ge, Te, or a combination thereof other than carbon atoms (for example, having 1 to 60 carbon atoms), as a ring-forming atom, and no aromaticity throughout its entire molecular structure. The term "divalent aromatic condensed heteropolycyclic group" as used herein refers to a divalent group having the same structure as the monovalent aromatic condensed heteropolycyclic group described above.

The term "monovalent aromatic condensed polycyclic group" as used herein refers to a monovalent group including two or more rings that are condensed with each other, including only carbon as a ring-forming atom (for example, 8 to 60 carbon atoms), and having non-aromaticity throughout its entire molecular structure. Examples of the monovalent non-aromatic condensed polycyclic group are a fluorenyl group and the like. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group having two or more rings condensed to each other, including a heteroatom N, O, P, Si, S, B, Se, Ge, Te, or a combination thereof other than carbon atoms (for example, 1 to 60 carbon atoms), as a ring-forming atom, and having no aromaticity throughout its entire molecular structure. Examples of the monovalent non-aromatic condensed heteropolycyclic group are a carbazolyl group and the like. The term "divalent non-aromatic condensed heteropolycyclic group" as used herein refers to a divalent group having the same structure as the monovalent non-aromatic condensed heteropolycyclic group described above.

The term "π electron-depleted nitrogen-containing $C_1$-$C_{60}$ cyclic group" as used herein refers to a cyclic group having 1 to 60 carbon atoms and including at least one *—N=*' (wherein * and *' each indicate a binding site to a neighboring atom) as a ring-forming moiety, and examples thereof are a) first ring, b) a condensed cyclic group in which two or more first rings are condensed with each other, or c) a condensed cyclic group in which at least one first ring is condensed with at least one second ring.

The term "π electron-rich $C_3$-$C_{60}$ cyclic group" as used herein refers to a cyclic group having 3 to 60 carbon atoms and not including *—N=*' (wherein * and *' each indicate a binding site to a neighboring atom) as a ring-forming moiety, examples thereof are a) a second ring or b) a condensed cyclic group in which two or more second rings are condensed with each other.

The term "$C_5$-$C_{60}$ carbocyclic group" as used herein refers to a monocyclic group or a polycyclic group, each having 5 to 60 carbon atoms, and examples thereof are a) a third ring or b) a condensed cyclic group in which two or more third rings are condensed with each other.

The term "$C_1$-$C_{60}$ heterocyclic group" as used herein refers to a monocyclic group or a polycyclic group, each having 1 to 60 carbon atoms, and examples thereof are a) a fourth ring, b) a condensed cyclic group in which two or more fourth rings are condensed with each other, or c) a condensed cyclic group in which at least one third ring and at least one four ring are condensed with each other.

The term "first ring" as used herein may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group.

The term "second ring" as used herein may be a benzene group, a cyclopentadiene group, a pyrrole group, a furan group, a thiophene group, or a silole group.

The term "third ring" as used herein may be a cyclopentane group, a cyclopentadiene group, an indene group, an adamantane group, a norbornene group, a bicyclo[1.1.1]pentane group, a bicyclo[2.1.1]hexane group, a bicyclo[2.2.1]heptane group (a norbornane group)), a bicyclo[2.2.2]octane group, a cyclohexane group, a cyclohexene group, or a benzene group.

The term "fourth ring" as used herein may be a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group.

For example, the π electron-depleted nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group.

For example, the π electron-rich $C_3$-$C_{60}$ cyclic group may be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonaphthothiophene group, an (indolo)phenanthrene group, a (benzofuran)phenanthrene group, or a (benzothieno)phenanthrene group.

For example, the $C_5$-$C_{60}$ carbocyclic group may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, an indene group, a fluorene group, a 5,6,7,8-tetrahydroisoquinoline group, a 5,6,7,8-tetrahydroquinoline group, an adamantane group, a norbornane group, or a norbornene group.

For example, the $C_1$-$C_{60}$ heterocyclic group may be a thiophene group, a furan group, a pyrrole group, a cyclopentadiene group, a silole group, a borole group, phosphole group, a selenophene group, a germole group, a benzothiophene group, a benzofuran group, an indole group, an indene group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluoren-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group.

The π electron-depleted nitrogen-containing $C_1$-$C_{60}$ cyclic group, the π electron-rich $C_3$-$C_{60}$ cyclic group, the $C_5$-$C_{60}$ cyclic group, and the $C_1$-$C_{60}$ heterocyclic group may each be a part of a condensed cycle or a monovalent, a divalent, a trivalent, a tetravalent, a pentavalent, or a hexavalent group, depending on the formula structure.

A substituent of at least one of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent aromatic condensed polycyclic group, the substituted monovalent aromatic condensed heteropolycyclic group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent aromatic condensed polycyclic group, a monovalent aromatic condensed heteropolycyclic group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent aromatic condensed polycyclic group, a monovalent aromatic condensed heteropolycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent aromatic condensed polycyclic group, a monovalent aromatic condensed heteropolycyclic group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent aromatic condensed polycyclic group, a monovalent aromatic condensed heteropolycyclic group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or any combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$), and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent aromatic condensed polycyclic group, a monovalent aromatic condensed heteropolycyclic group, a monovalent non-aromatic condensed polycyclic group, or a monovalent non-aromatic condensed heteropolycyclic group.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$alkyl substituent may be present on the $C_1$-$C_{60}$alkyl group. This definition is not limited to the $C_1$-$C_{60}$ alkyl group and applies to all substituted groups that recite a carbon range.

The term "room temperature" as used herein refers to a temperature of about 25° C.

The terms "a biphenyl group, a terphenyl group, and a tetraphenyl group" as used herein each refer to a monovalent group having two, three, and four phenyl groups linked via single bonds, respectively.

The terms "a cyano-containing phenyl group, a cyano-containing biphenyl group, a cyano-containing terphenyl group, and a cyano-containing tetraphenyl group" as used herein respectively refer to a phenyl group, a biphenyl group, a terphenyl group, and a tetraphenyl group, each of which is substituted with at least one cyano group. In "a cyano-containing phenyl group, a cyano-containing biphenyl group, a cyano-containing terphenyl group, and a cyano-containing tetraphenyl group", a cyano group may be substituted to any position of the corresponding group, and the "cyano-containing phenyl group, the cyano-containing biphenyl group, the cyano-containing terphenyl group, and the cyano-containing tetraphenyl group" may further include substituents other than a cyano group. For example, a phenyl group substituted with a cyano group and a phenyl group substituted with a cyano group and a methyl group may all belong to "a cyano-containing phenyl group".

Hereinafter, a compound and an organic light-emitting device according to embodiments are described in detail with reference to Synthesis Examples and Examples. However, the organic light-emitting device is not limited thereto. The wording "'B' was used instead of 'A'" used in describing Synthesis Examples means that an amount of 'A' used was identical to an amount of 'B' used, in terms of a molar equivalent.

EXAMPLES
Synthesis Example 1: Synthesis of Compound 1
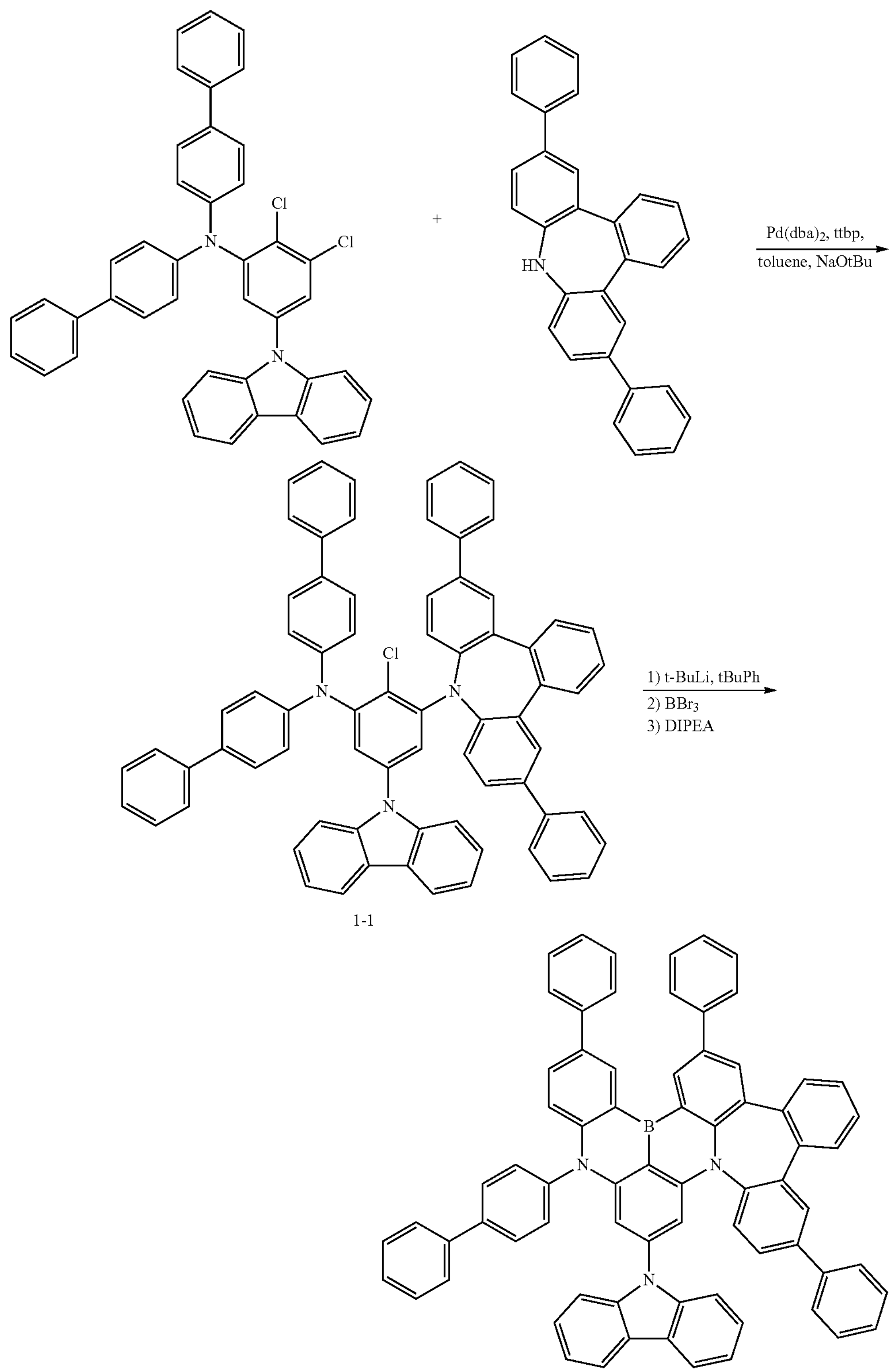
1-1
1

(1) Synthesis of Intermediate 1-1

In a 100 ml round-bottom flask, N-(5-(9H-carbazol-9-yl)-2,3-dichlorophenyl)-N-([1,1'-biphenyl]-4-yl)-[1,1'-biphenyl]-4-amine (3.3 g, 5.19 mmol), 6,12-diphenyl-9H-tribenzo[b,d,f]azepine (1.95 g, 4.93 mmol), $Pd(dba)_2$ (0.3 g, 0.52 mmol), SPhos (0.21 g, 0.52 mmol), and NaOtBu (0.75 g, 7.78 mmol) were mixed with toluene (31 ml), and the mixed solution was stirred by heating at 120° C. for 2 hours in a nitrogen atmosphere. The solvent of the reaction mixture obtained therefrom was removed using a rotary evaporator, and dichloromethane (200 ml) was added thereto to dissolve the reaction product. A washing process was performed thereon twice with water (200 ml), and water was removed using anhydrous $MgSO_4$, and the solvent was removed using a rotary evaporator. The resulting product was then purified by silica gel column chromatography (dichloromethane/n-hexane), so as to obtain, as Intermediate 1-1, N-(5-(9H-carbazol-9-yl)-2-chloro-3-(6,12-diphenyl-9H-tribenzo[b,d,f]azepin-9-yl)phenyl)-N-([1,1'-biphenyl]-4-yl)-[1,1'-biphenyl]-4-amine (2.94 g). Intermediate 1-1 thus obtained was identified by LC-MS.

$C_{72}H_{48}Cl_1N_3$: 990.311

(2) Synthesis of Compound 1

In a 250 ml round-bottom flask, Intermediate 1-1 (4.67 g, 4.71 mmol) was mixed with t-butylbenzene (94 ml), and 1.6 M tert-BuLi pentane solution (7.4 ml, 11.77 mmol) was added thereto at −78° C. in a nitrogen atmosphere. The reaction temperature was raised to 60° C., and then, the mixed solution was stirred for 1 hour. The reaction solution was cooled to −40° C., and $BBr_3$ (0.91 ml, 9.42 mmol) was added thereto and stirred at room temperature for 1 hour. Afterwards, the reaction solution was cooled to −40° C. again, and N,N-diisopropylethylamine (1.81 ml, 10.36 mmol) was added thereto and stirred by heating at 120° C. for 4 hours. After the reaction solution was cooled to room temperature, saturated aqueous solution of NaOAc and ethyl acetate (200 ml) were added thereto. A washing process was performed thereon using water (300 ml), and the organic layer was dried using anhydrous $MgSO_4$. The solvent of the reaction product was removed using a rotary evaporator, and the resultant product was then purified by silica gel column chromatography (dichloromethane/n-hexane), so as to obtain Compound 1 (1.5 g). Compound 1 thus obtained was confirmed by LC-MS.

$C_{72}H_{46}BN_3$: 964.333

Example 1-1

An ITO glass substrate was cut to a size of 50 mm×50 mm×0.5 mm, sonicated in acetone isopropyl alcohol and pure water, each for 15 minutes, and then, washed by exposure to ultraviolet (UV) light ozone for 30 minutes.

Subsequently, HAT-CN was deposited on the ITO electrode (anode) on the glass substrate to form a hole injection layer having a thickness of 100 Å, NPB was deposited on the hole injection layer to form a first hole transport layer having a thickness of 500 Å, TCTA was deposited on the first hole transport layer to form a second hole transport layer having a thickness of 50 Å, and mCP was deposited on the second hole transport layer to form an electron blocking layer having a thickness of 50 Å.

A first host (Compound H1), a second host (Compound H2), and a sensitizer (Compound 1) were co-deposited on the electron blocking layer to form an emission layer having a thickness of 400 Å. Here, the first host and the second host were mixed at a ratio of 60:40, and the amount of the emitter was adjusted to be 3 wt % based on the total weight of the first host, the second host, and the emitter.

DBFPO was deposited on the emission layer to form a hole blocking layer having a thickness of 100 Å, DBFPO and LiQ were co-deposited thereon at a weight ratio of 5:5 to form an electron transport layer having a thickness of 300 Å, LiQ was deposited on the electron transport layer to form an electron injection layer having a thickness of 10 Å, an then, Al was deposited on the electron injection layer to form a cathode having a thickness of 1,000 Å, thereby completing the manufacture of an organic light-emitting device.

HT-D1(HAT-CN)

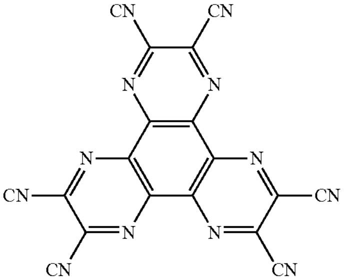

NPB

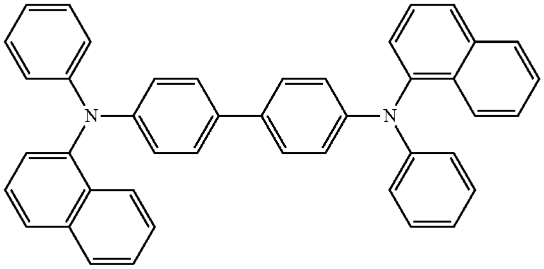

TCTA

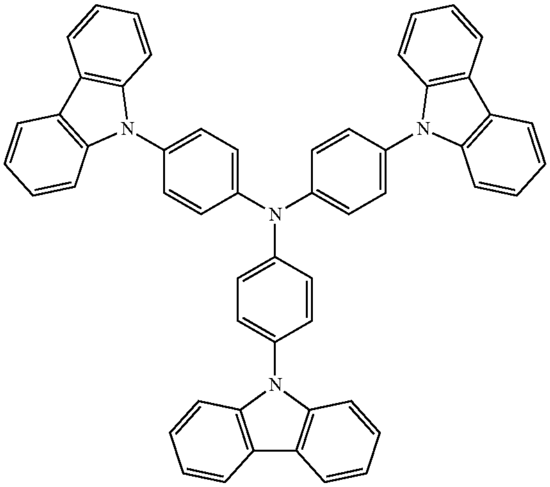

mCP

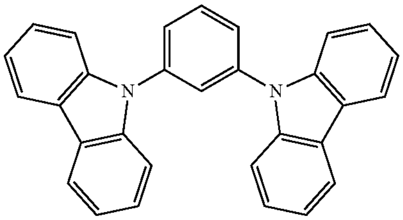

-continued

H1

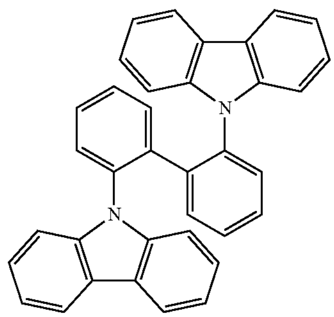

H2

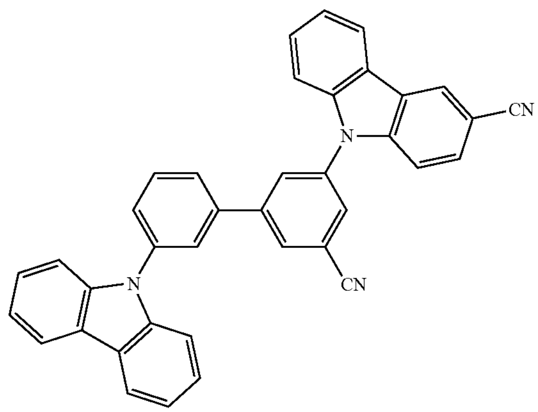

DBFPO

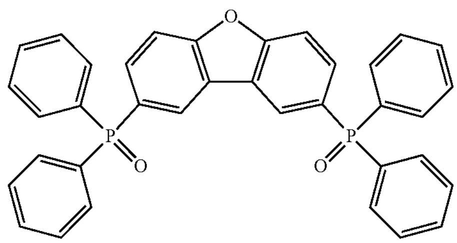

Liq

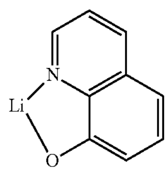

Comparative Example 1-1

An organic light-emitting device was manufactured in the same manner as in Example 1-1, except that, in forming an emission layer, for use as a dopant, corresponding compounds shown in Table 3 were used.

Example 2-1

A glass substrate with an ITO electrode arranged thereon was cut to a size of 50 mm×50 mm×0.5 mm, sonicated in acetone isopropyl alcohol and pure water, each for 15 minutes, and then, washed by exposure to UV ozone for 30 minutes.

Subsequently, HAT-CN was deposited on the ITO electrode (anode) on the glass substrate to form a hole injection layer having a thickness of 100 Å, NPB was deposited on the hole injection layer to form a first hole transport layer having a thickness of 500 Å, TCTA was deposited on the first hole transport layer to form a second hole transport layer having a thickness of 50 Å, and mCP was deposited on the second hole transport layer to form an electron blocking layer having a thickness of 50 Å.

A first host (Compound H1), a second host (Compound H2), a sensitizer (Compound S-1), and an emitter (Compound 1) were co-deposited on the electron blocking layer to form an emission layer having a thickness of 400 Å. Here, the first host and the second host were mixed at a ratio of 60:40, and the amounts of the sensitizer and the emitter were adjusted to be 15 wt % and 1 wt %, respectively, based on the total weight of the first host, the second host, the sensitizer, and the emitter.

DBFPO was deposited on the emission layer to form a hole blocking layer having a thickness of 100 Å, DBFPO was deposited on the emission layer to form a hole blocking layer having a thickness of 100 Å, DBFPO and LiQ were co-deposited thereon at a weight ratio of 5:5 to form an electron transport layer having a thickness of 300 Å, LiQ was deposited on the electron transport layer to form an electron injection layer having a thickness of 10 Å, an then, Al was deposited on the electron injection layer to form a cathode having a thickness of 1,000 Å, thereby completing the manufacture of an organic light-emitting device, and then DBFPO and LiQ were co-deposited thereon at a weight ratio of 5:5 to form an electron transport layer having a thickness of 300 Å, and then, LiQ was deposited on the electron transport layer to form an electron injection layer having a thickness of 10 Å, and Al was deposited on the electron injection layer to form a cathode having a thickness of 1,000 Å, thereby completing the manufacture of an organic light-emitting device.

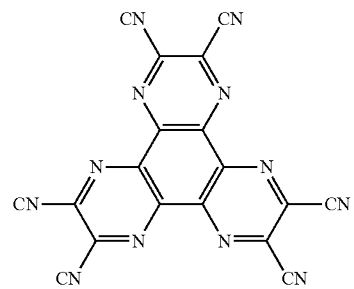

HT—D1(HAT—CN)

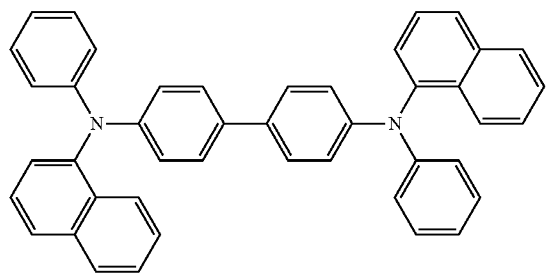

NPB

-continued

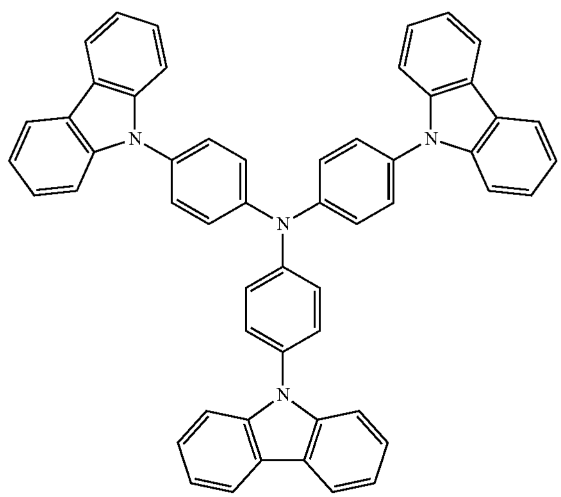

TCTA

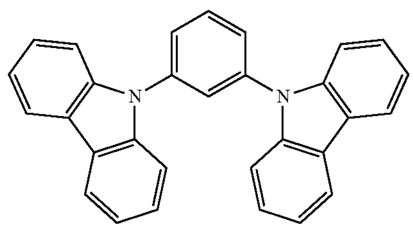

mCP

H1

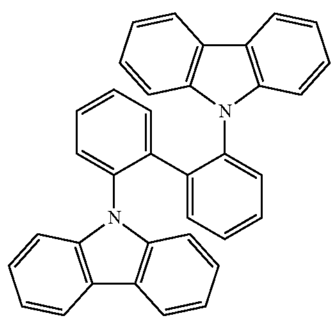

H2

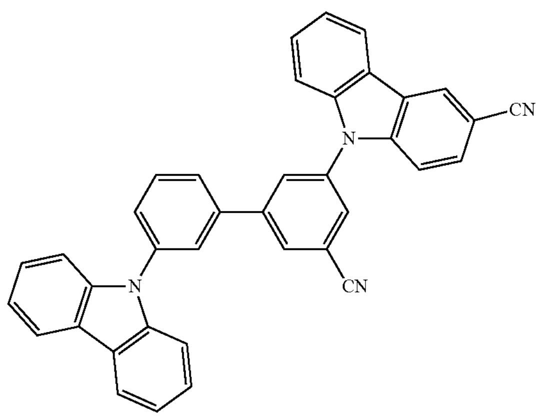

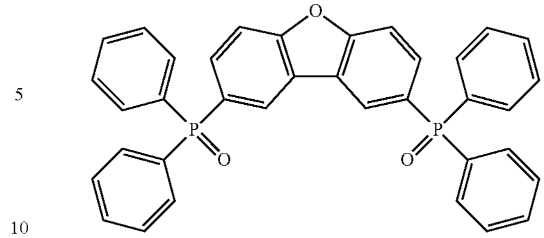

DBFPO

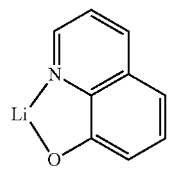

Liq

S-1

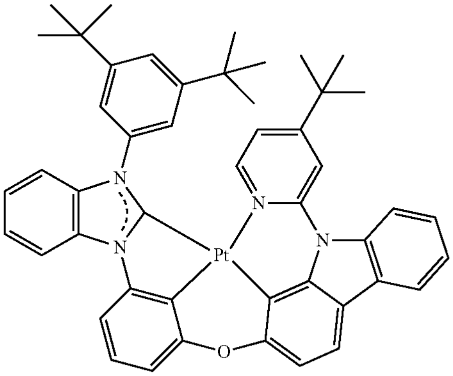

Comparative Examples 2-1 and 2-2

Organic light-emitting devices were manufactured in the same manner as in Example 2-1, except that, in forming an emission layer, for use as a sensitizer and a dopant, corresponding compounds shown in Table 7 were used.

Evaluation Example: Evaluation of Organic Light-Emitting Device Characteristics

The driving voltage, maximum external quantum efficiency, power efficiency, current efficiency, CIE color coordinates (at 1000 nit), conversion efficiency, and full width at half maximum of the organic light emitting devices manufactured in Examples and Comparative Examples above were measured using a current-voltage meter (Keithley 2400) and a luminance meter (Minolta Cs-1000 Å), and results thereof are summarized in Tables 8 and 9.

TABLE 8

| | Dopant | Driving voltage (V) | $EQE_{max}$ (%) | Lifespan (T95) (%) |
|---|---|---|---|---|
| Example 1-1 | 1 | 4.46 | 264 | 531 |
| Comparative Example 1-1 | C1 | 5.56 | 100 | 100 |

TABLE 9

| | Sensitizer | Dopant | Driving voltage (V) | $EQE_{max}$ (%) | Lifespan (T95) (%) |
|---|---|---|---|---|---|
| Example 2-1 | S-1 | 1 | 4.19 | 147 | 1052 |
| Comparative Example 2-1 | S-1 | C1 | 4.59 | 100 | 100 |
| Comparative Example 2-2 | S-1 | C2 | 4.43 | 74 | 116 |

C1

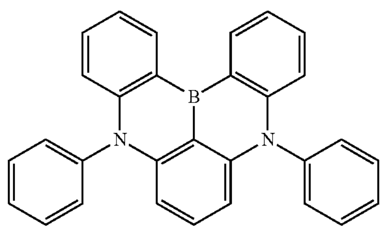

C2

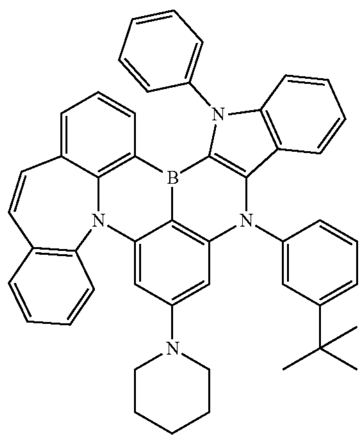

Referring to Tables 8 and 9, it was confirmed that the organic light-emitting device of Examples above had higher efficiency and/or longer lifespan than the organic light-emitting devices of Comparative Examples above.

In addition, referring to Tables 8 and 9, it was confirmed that the heterocyclic compound was applicable to all organic light-emitting devices that emit light through various mechanisms.

As described above, according to the one or more embodiments, an organic light-emitting device including a heterocyclic compound may have improved efficiency and/or excellent colorimetric purity.

It should be understood that embodiments described herein should be considered in a descriptive sense only and not for purposes of limitation. Descriptions of features or aspects within each embodiment should typically be considered as available for other similar features or aspects in one or more embodiments. While one or more embodiments have been described with reference to the figures, it will be understood by those of ordinary skill in the art that various changes in form and details may be made therein without departing from the spirit and scope as defined by the following claims.

What is claimed is:

1. A heterocyclic compound represented by Formula 1-1:

Formula 1-1

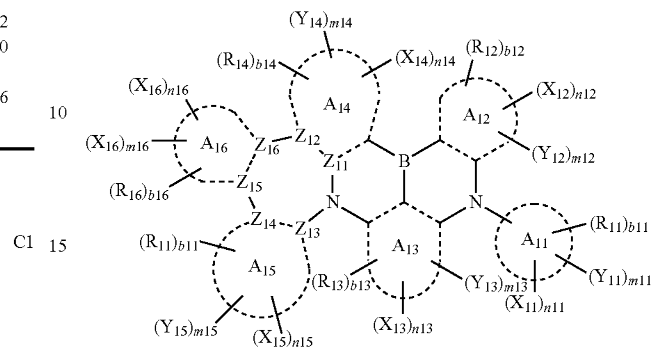

wherein, in Formulae 1-1, $A_{11}$ to $A_{16}$ are each independently a substituted or unsubstituted $C_5$-$C_{30}$ carbocyclic group or a substituted or unsubstituted $C_1$-$C_{30}$ heterocyclic group, $X_{11}$ to $X_{16}$ are each independently a group represented by Formula 2-1 or 2-2, n11 to n16 are each independently 0, 1, or 2, the sum of n11 to n16 in Formula 1-1 is 2 or more, $Y_{11}$ to $Y_{16}$ are each independently a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group, m11 to m16 are each independently 0, 1, or 2, the sum of n11 to n16 and m11 to m16 in Formula 1-1 is 3 or more, the $Z_{11}$ to $Z_{16}$ are each independently a carbon atom, and a bond between $Z_{11}$ and $Z_{12}$, a bond between $Z_{13}$ and $Z_{14}$, and a bond between $Z_{15}$ and $Z_{16}$ are each independently a single bond or a double bond, Formula 2-1

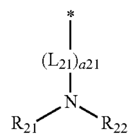

Formula 2-2

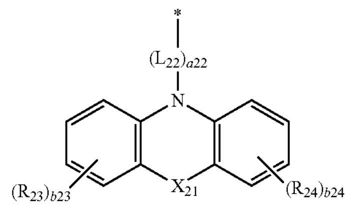

wherein, in Formulae 2-1 and 2-2, $X_{21}$ is a single bond, O, S, $N(R_{25})$, or $C(R_{25})(R_{26})$, $L_{21}$ and $L_{22}$ are each independently a substituted or unsubstituted $C_5$-$C_{30}$ carbocyclic group or a substituted or unsubstituted $C_1$-$C_{30}$ heterocyclic group, a21 and a22 are each independently 0, 1, or 2, $R_{21}$ and $R_{22}$ are each independently a substituted or unsubstituted $C_6$-$C_{60}$ aryl group, $R_{11}$ to $R_{16}$ and $R_{23}$ to $R_{26}$ are each independently hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$C(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, b11 to b16 are each independently 0, 1, 2, or 3, b23 and b24 are each independently 0, 1, 2, 3, or 4, $Q_1$ to $Q_3$ are each independently hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof, and

* indicates a binding site to a neighboring atom.

2. The heterocyclic compound of claim 1, wherein the heterocyclic compound is represented by one of Formula 1-111:

1-111

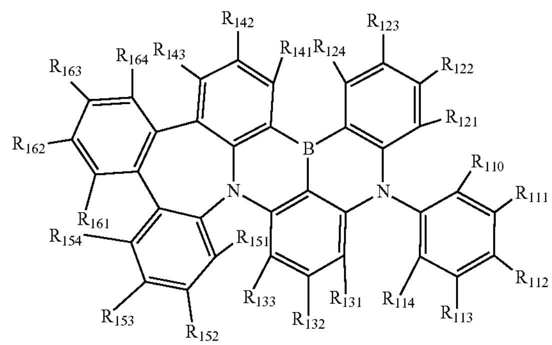

wherein, in Formula 1-111, $R_{110}$ to $R_{114}$ may each independently be $X_{11}$, $Y_{11}$, or $R_{11}$, $R_{121}$ to $R_{124}$ may each independently be $X_{12}$, $Y_{12}$, or $R_{12}$, $R_{131}$ to $R_{133}$ may each independently be $X_{13}$, $Y_{13}$, or $R_{13}$, $R_{141}$ to $R_{143}$ may each independently be $X_{14}$, $Y_{14}$, or $R_{14}$, $R_{151}$ to $R_{154}$ may each independently be $X_{15}$, $Y_{15}$, or $R_{15}$, $R_{161}$ to $R_{164}$ may each independently be $X_{16}$, $Y_{16}$, or $R_{16}$, and $X_{11}$ to $X_{16}$, $Y_{11}$ to $Y_{16}$, and $R_{11}$ to $R_{16}$ are respectively the same as described in claim 1.

3. The heterocyclic compound of claim 1, wherein $X_{11}$ to $X_{16}$ are each independently a group represented by Formula 2-11 or 2-21:

Formula 2-11

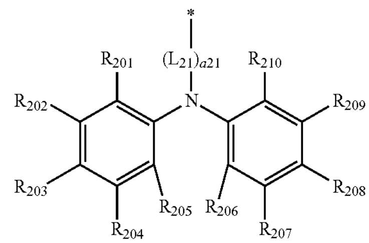

Formula 2-21

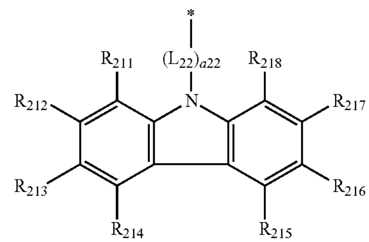

wherein, in Formulae 2-11 and 2-21, $L_{21}$ and $L_{22}$ are respectively the same as described in claim 1, a21 and a22 are each independently 0 or 1, and $R_{201}$ to $R_{218}$ are each independently hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group.

4. The heterocyclic compound of claim 1, wherein $X_{11}$ to $X_{16}$ are each independently represented by one of Formulae 2-111 to 2-122:

2-111

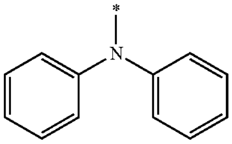

2-112

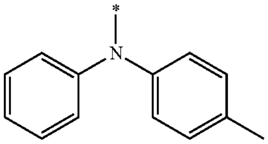

2-113

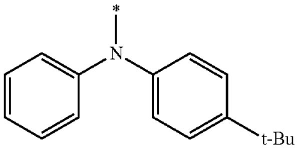

2-114

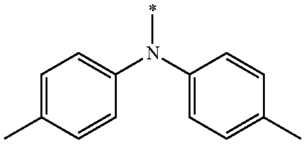

2-115

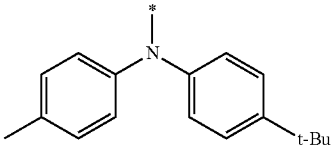

2-116

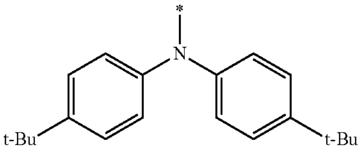

2-117

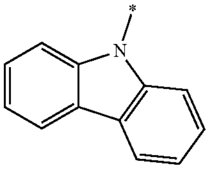

2-118

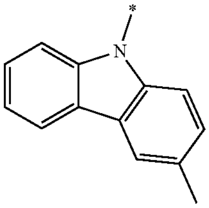

-continued 2-119

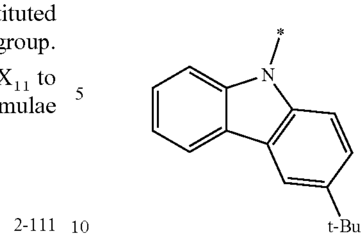

2-120

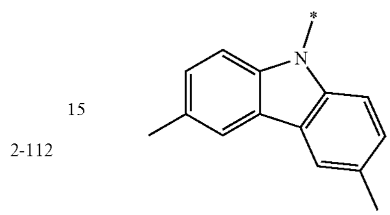

2-121

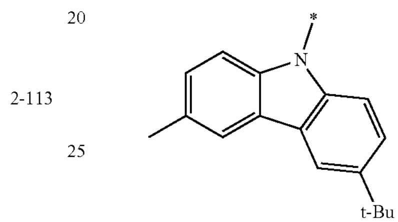

2-122

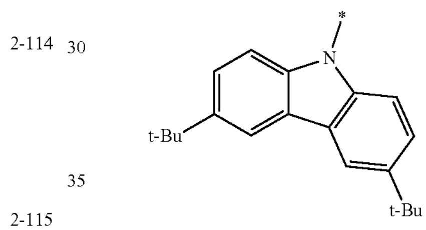

wherein, in Formulae 2-111 to 2-122, t-Bu represents a tert-butyl group, and

* indicates a binding site to a neighboring atom.

5. The heterocyclic compound of claim 1, wherein $Y_{11}$ to $Y_{16}$ are each independently a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, or a chrysenyl group, each substituted or unsubstituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl) adamantanyl group, a ($C_1$-$C_{20}$ alkyl) norbornanyl group, a ($C_1$-$C_{20}$ alkyl) norbornenyl group, a ($C_1$-$C_{20}$)cyclopentenyl group, a ($C_1$-$C_{20}$) cyclohexenyl group, a ($C_1$-$C_{20}$ alkyl)cycloheptenyl group, a ($C_1$-$C_{20}$ alkyl) bicyclo[1.1.1]pentyl group, a ($C_1$-$C_{20}$ alkyl) bicyclo[2.1.1]hexyl group, a ($C_1$-$C_{20}$ alkyl) bicyclo[2.2.1]heptyl group, a ($C_1$-$C_{20}$ alkyl) bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, or any combination thereof.

6. The heterocyclic compound of claim 1, wherein the sum of n11 to n15 in Formula 1-1 is 1 or 2.

7. The heterocyclic compound of claim 1, wherein the sum of m11 to m16 in Formula 1-1 is 1 or more.

8. The heterocyclic compound of claim 1, wherein, in Formula 1-1, the combined sum of n11 to n15 and m11 to m15 is 2, 3, 4, or 5.

9. The heterocyclic compound of claim 1, wherein the heterocyclic compound is represented by one of Formulae 1-11 to 1-24:

1-11

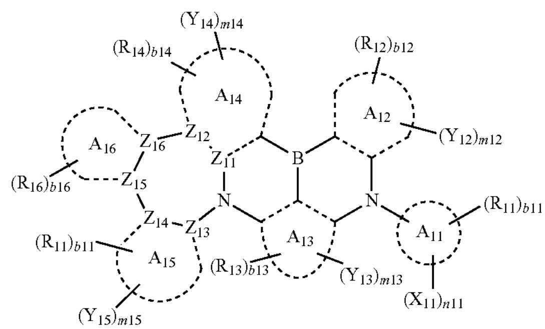

1-12

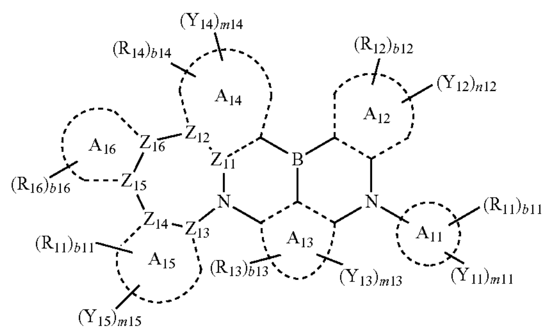

1-13

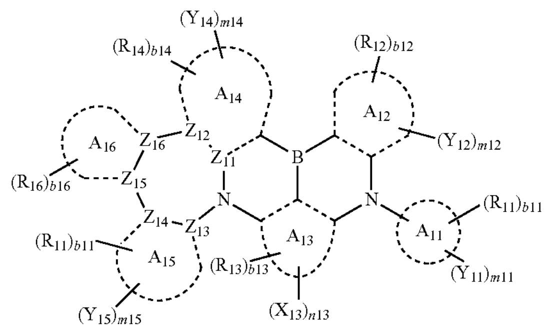

-continued 1-14

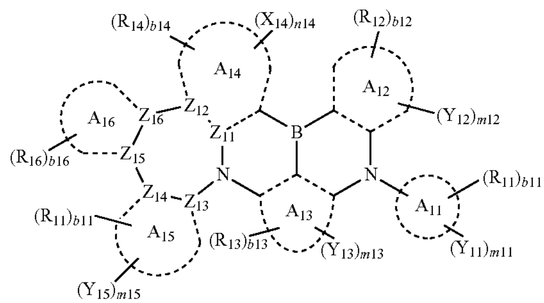

1-15

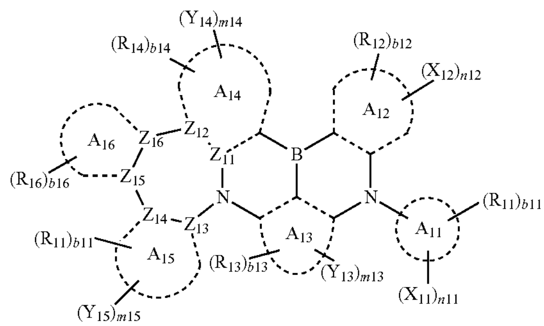

1-16

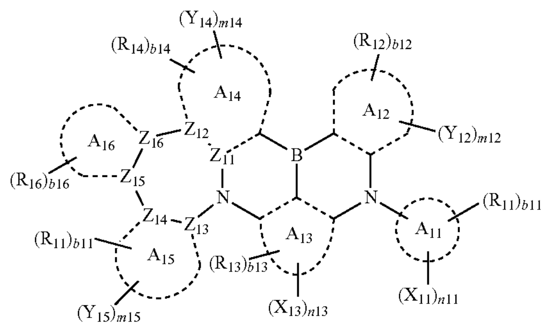

1-17

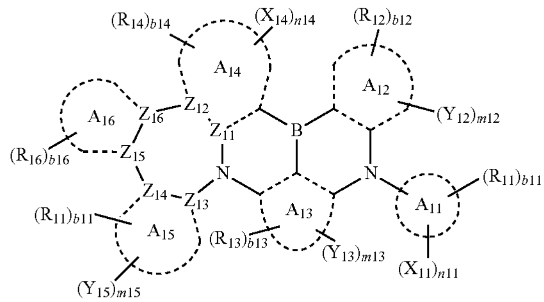

-continued 1-18

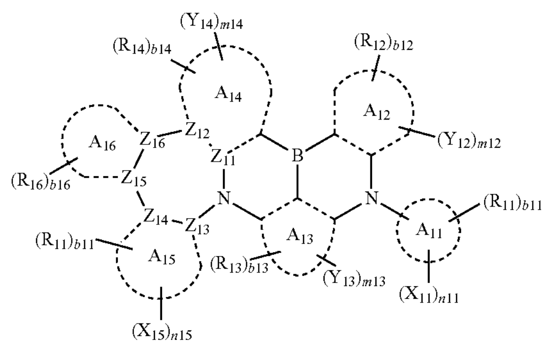

1-19

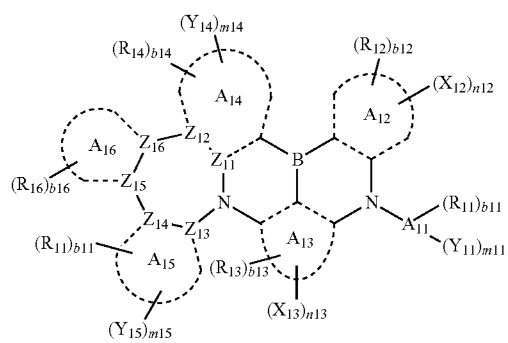

1-20

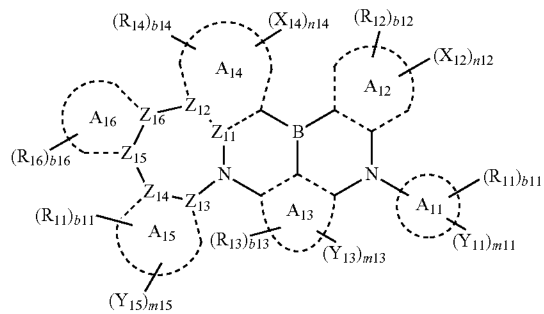

1-21

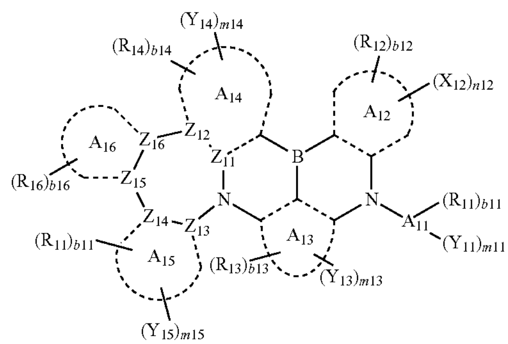

-continued 1-22

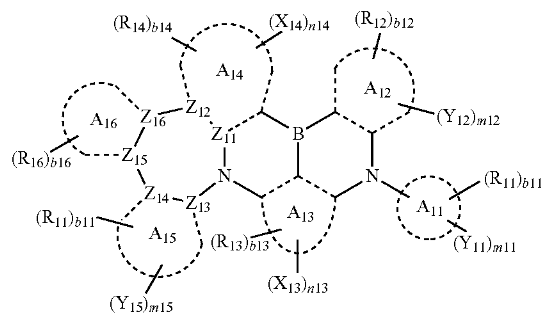

1-23

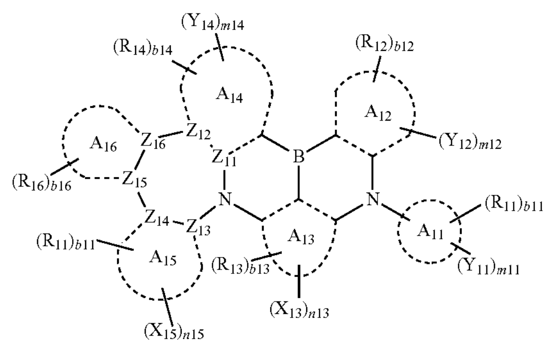

1-24

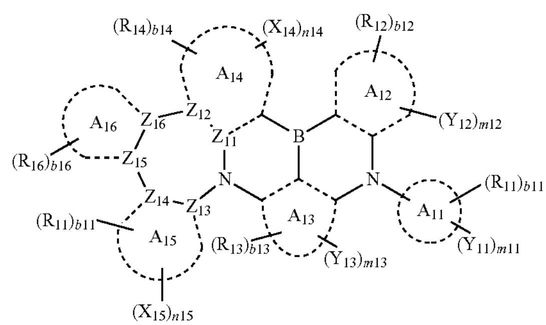

wherein, in Formulae 1-11 to 1-24, $A_{11}$ to $A_{16}$, $X_{11}$ to $X_{16}$, $Y_{11}$ to $Y_{16}$, $Z_{11}$ to $Z_{16}$, $R_{11}$ to $R_{16}$, and b11 to b16 are respectively the same as described in claim 1, n11 to n15 are each independently 1 or 2, m11 to m15 are each independently 0, 1, or 2, and the combined sum of n11 to n15 and m11 to m15 is 3 or more.

10. The heterocyclic compound of claim 1, wherein the heterocyclic compound is one of the following Compounds:

3
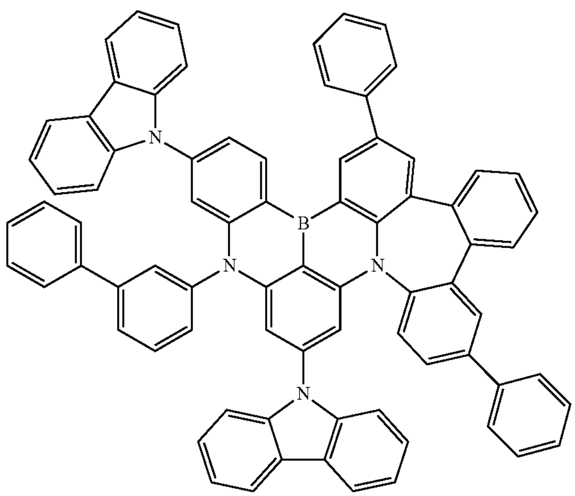
6
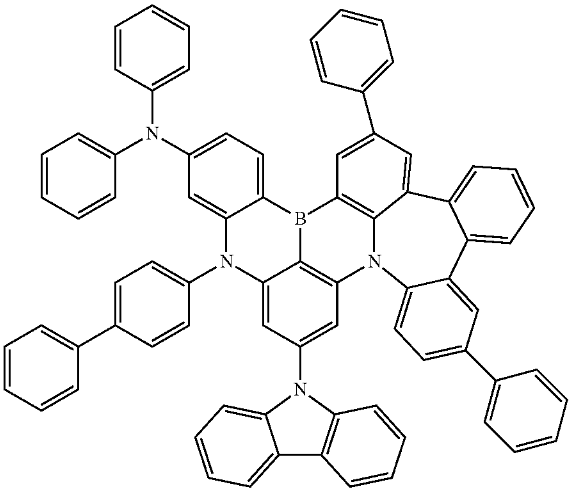
8
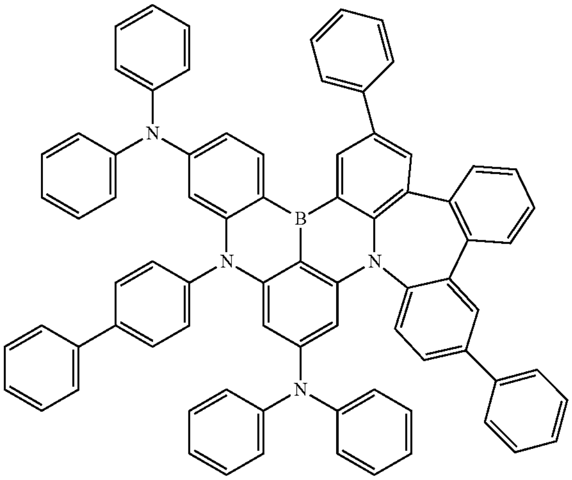
-continued
9
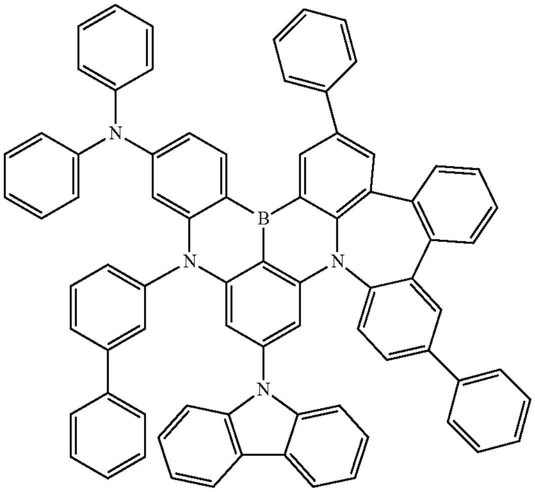
10
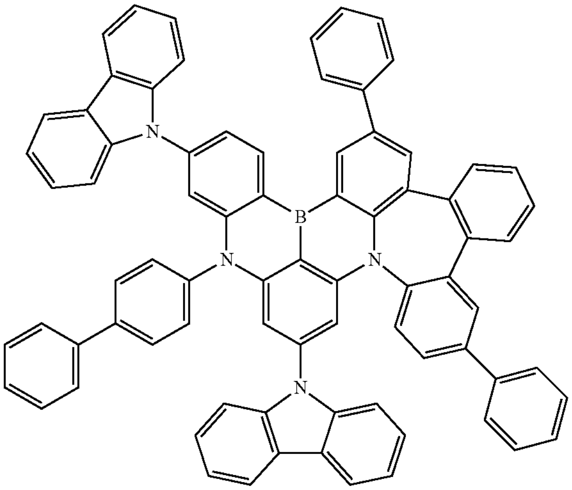
12
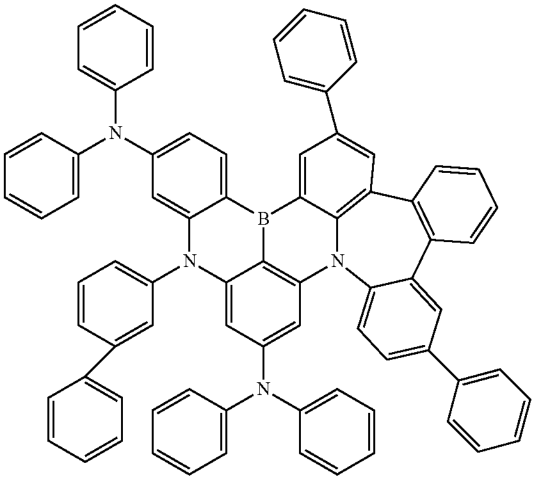

-continued
13
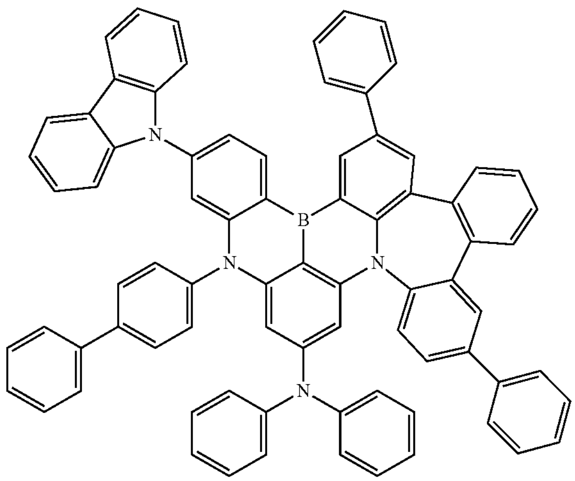
14
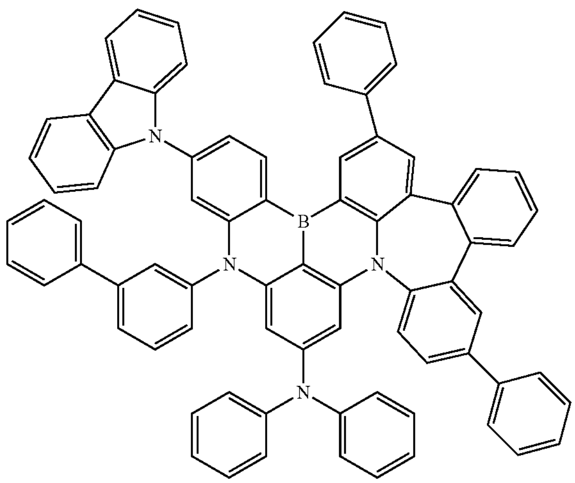
19
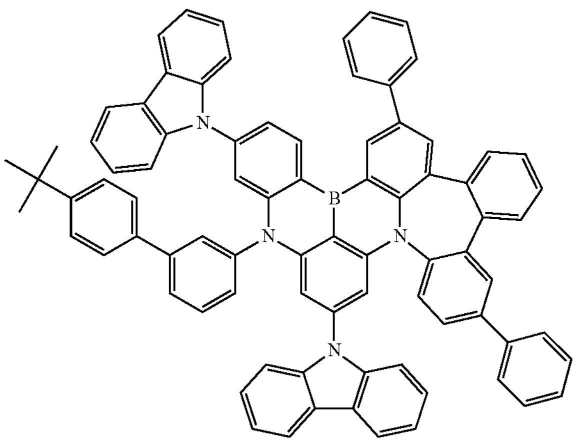
-continued
22
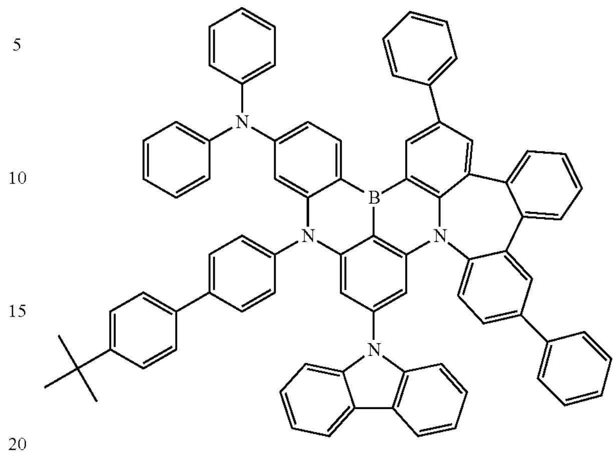
24
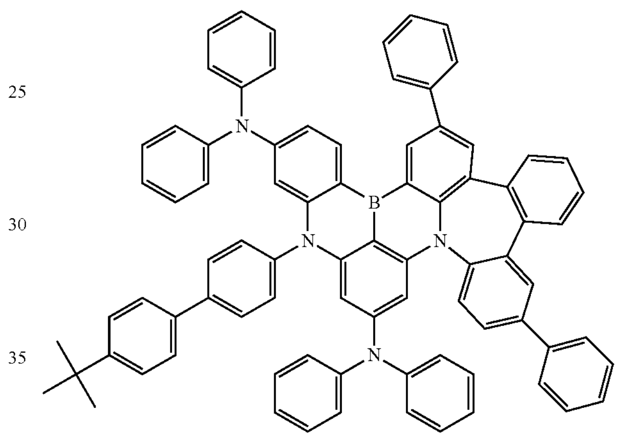
25
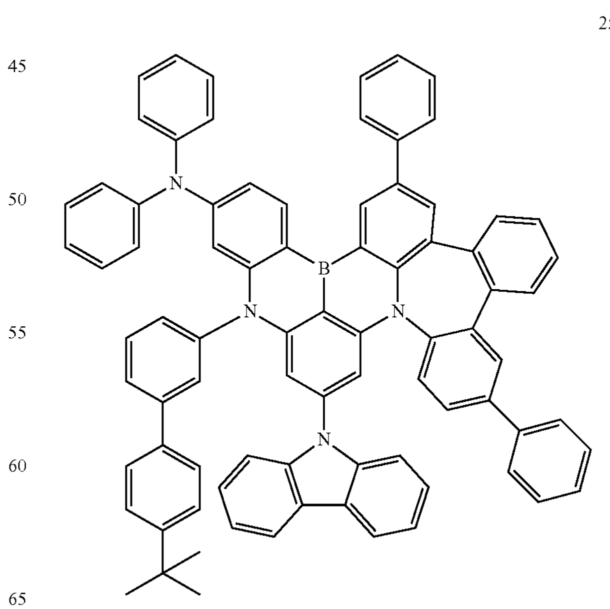

26
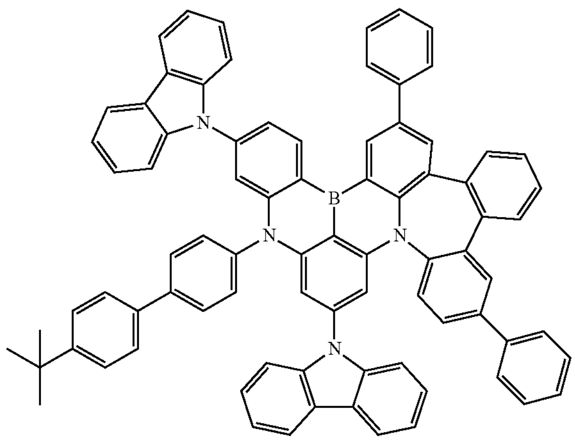
28
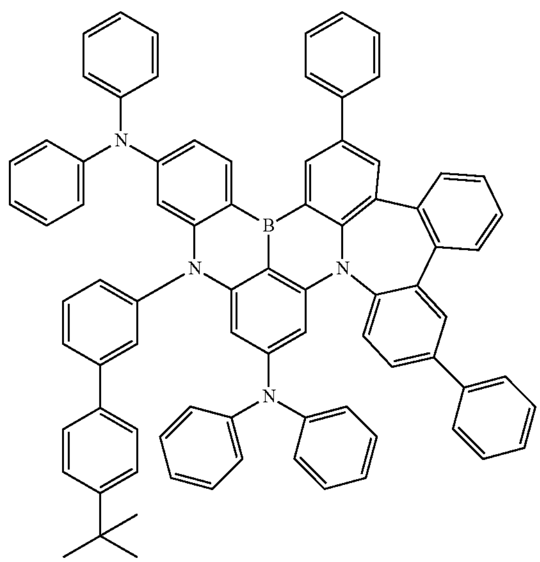
29
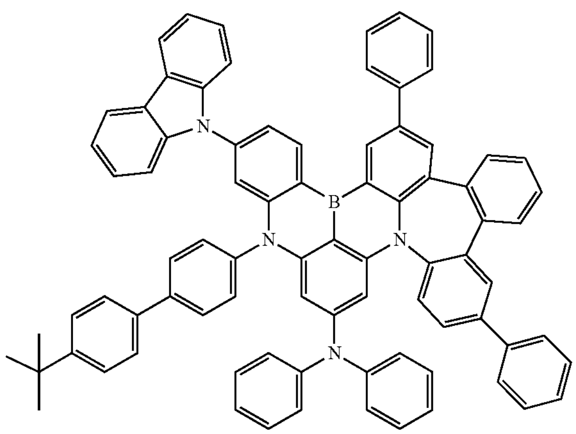
-continued
30
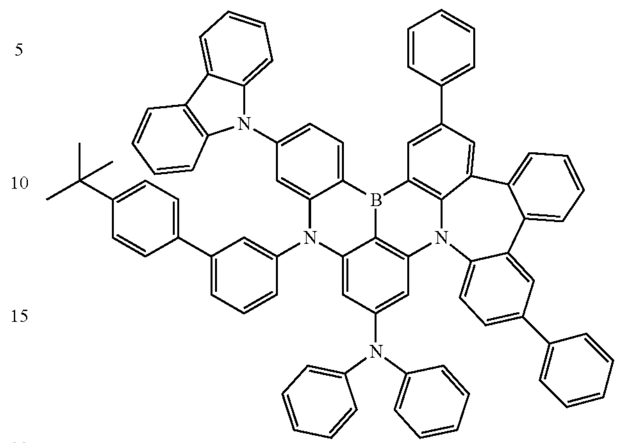
35
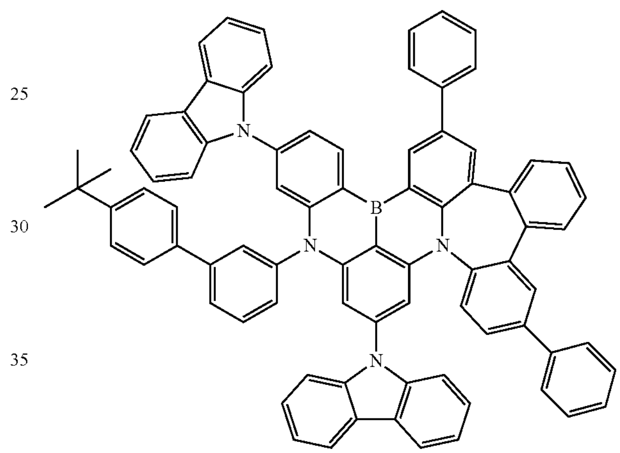
38
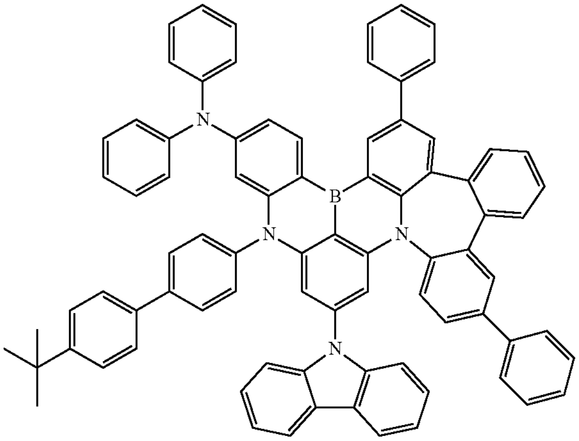

-continued
40
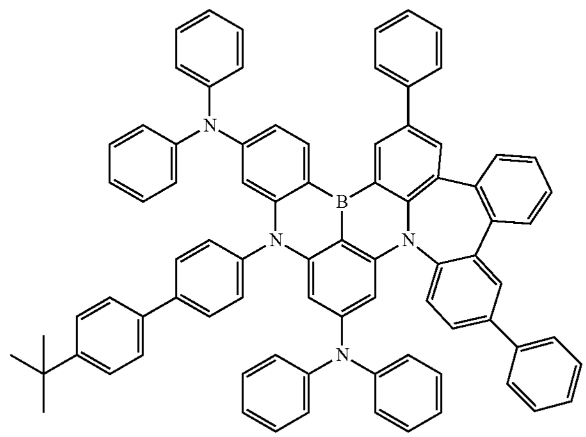
41
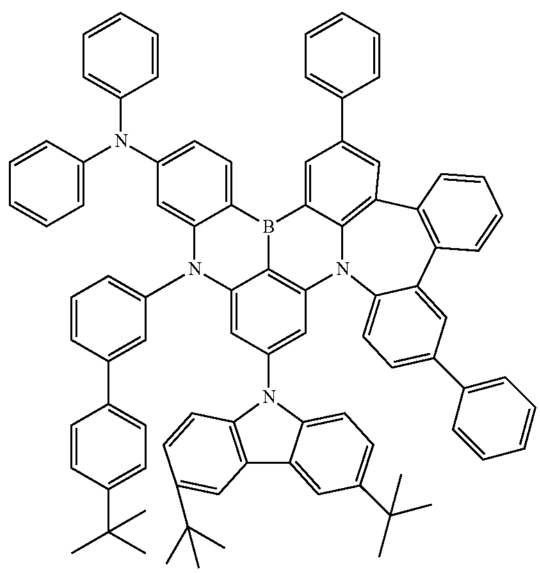
42
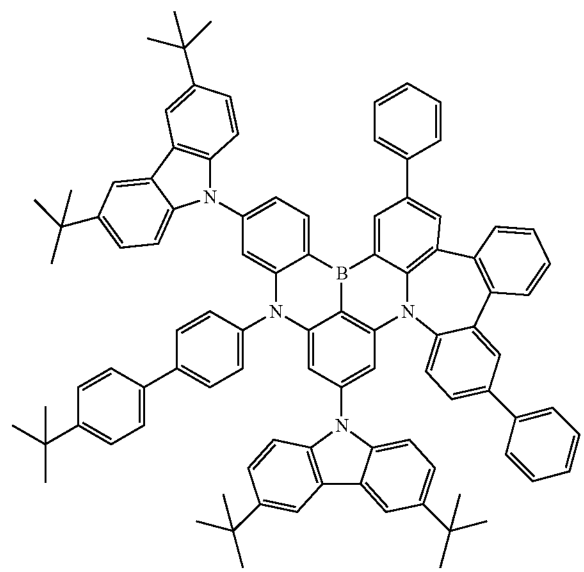
-continued
44
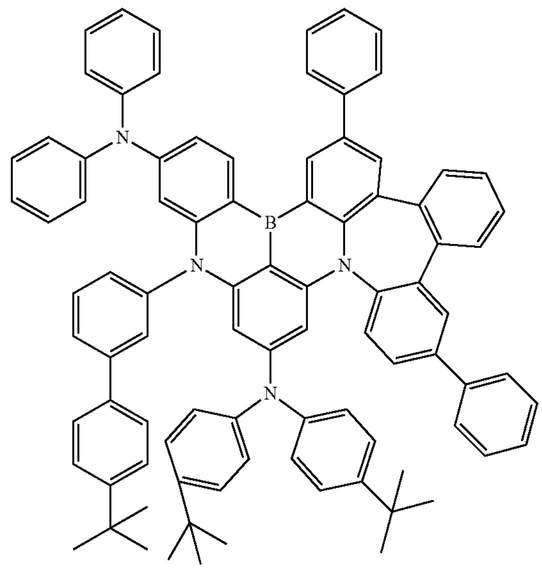
45
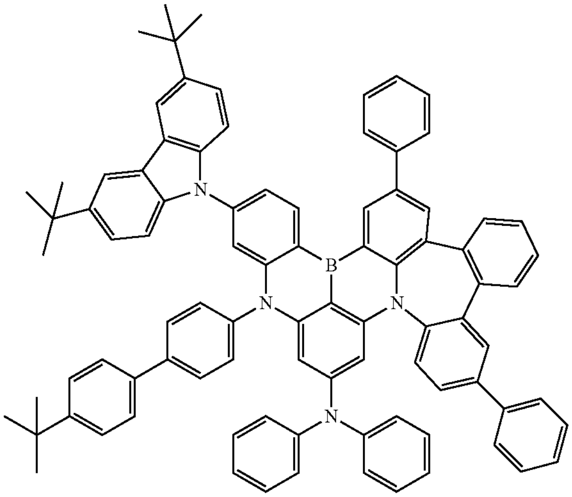

-continued
46
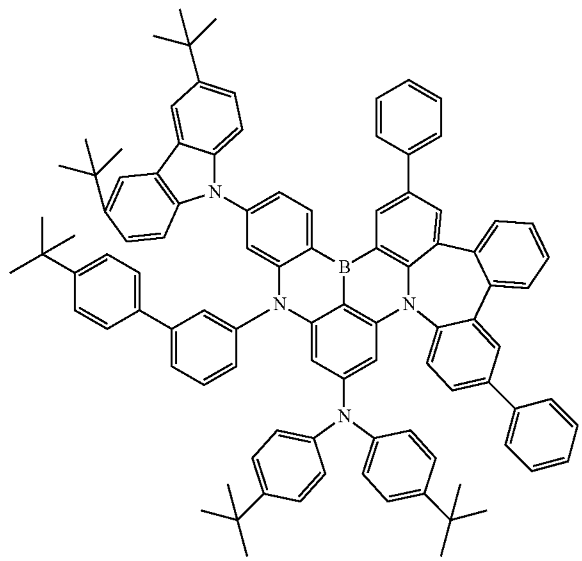
51
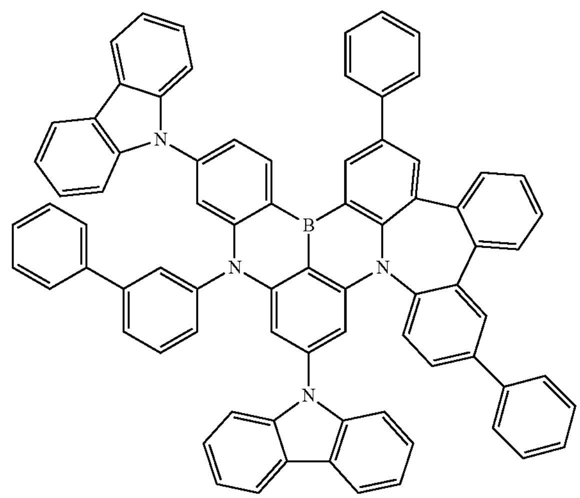
52
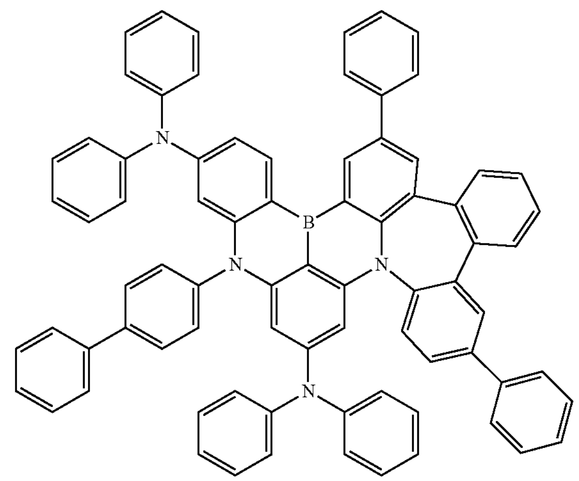
-continued
56
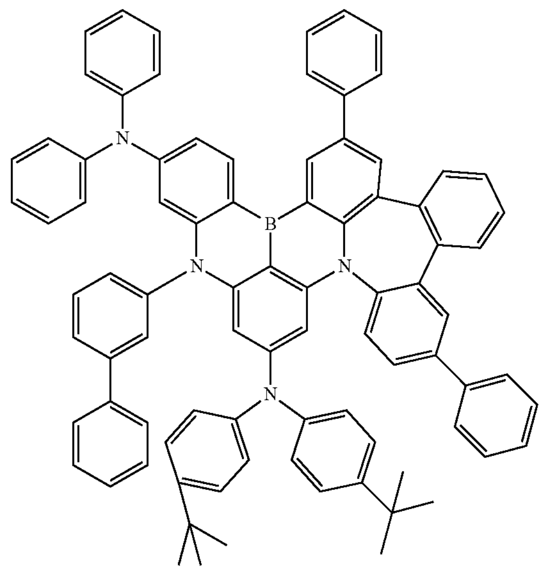
57
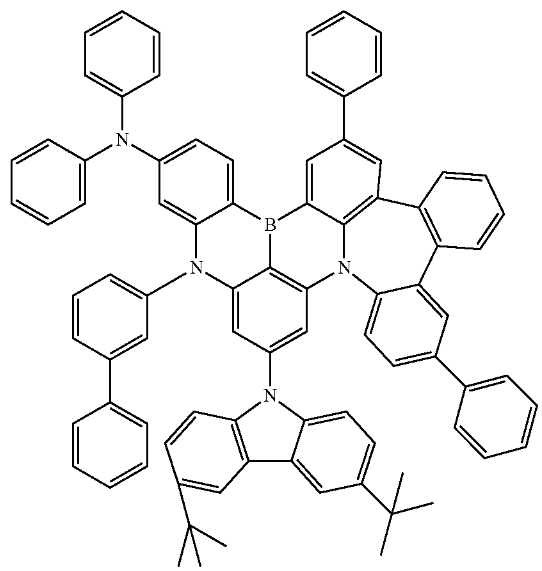

-continued
58
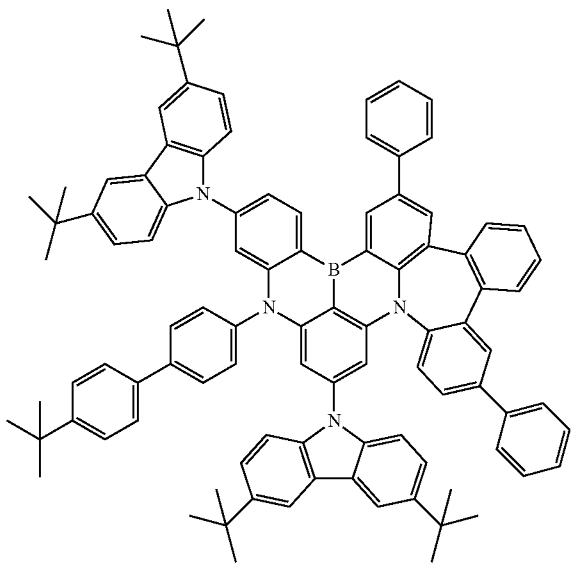
61
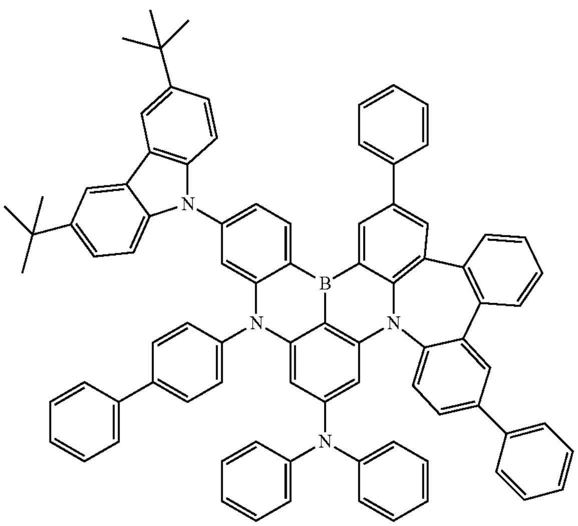
-continued
62
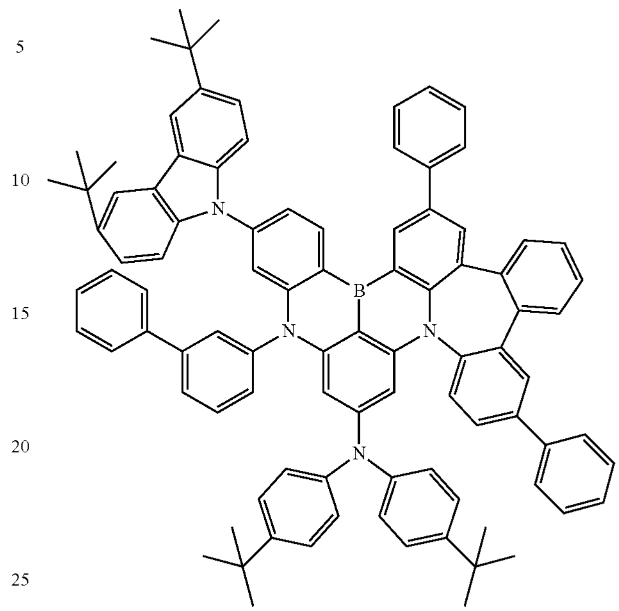
63
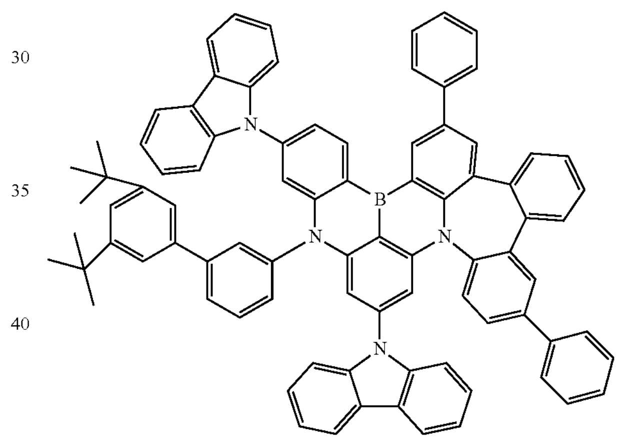
68
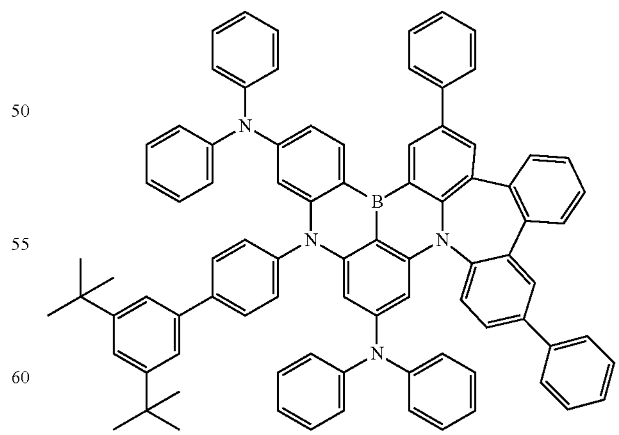

-continued

72

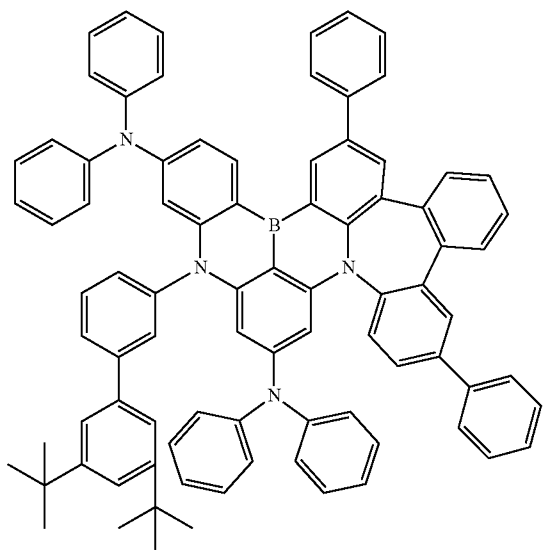

73

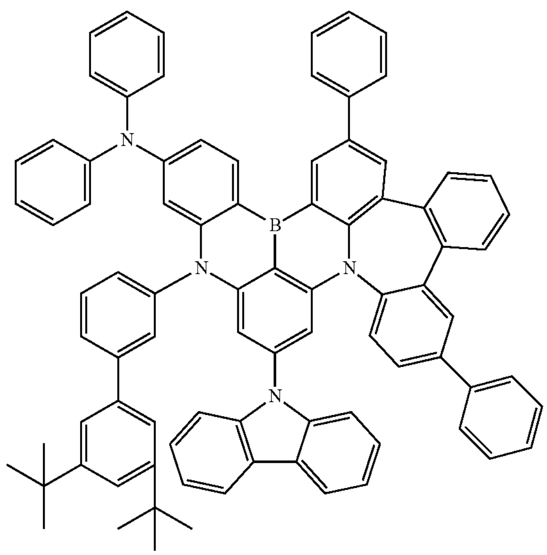

74

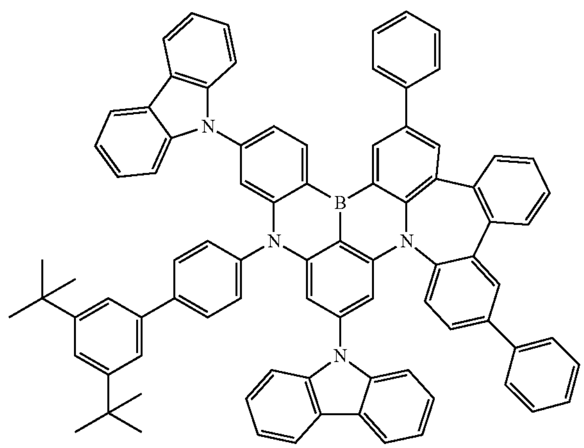

-continued

75

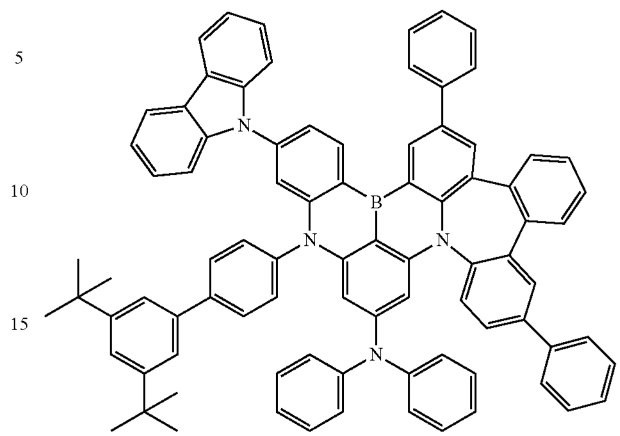

76

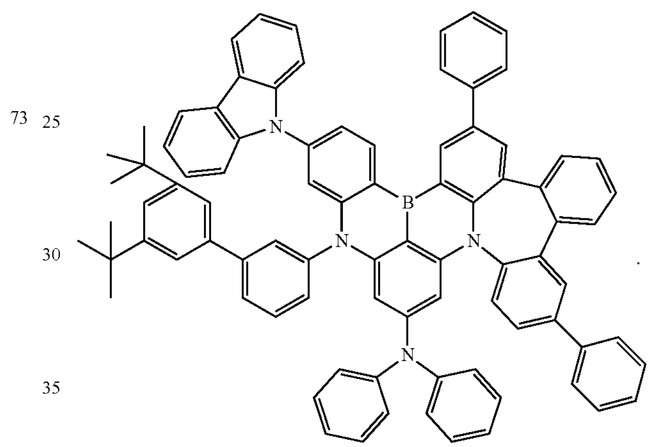

.

11. An organic light-emitting device comprising:

a first electrode;

a second electrode; and an organic layer arranged between the first electrode and the second electrode and comprising an emission layer, wherein the organic layer comprises the heterocyclic compound of claim 1.

12. The organic light-emitting device of claim 11, wherein the emission layer comprises the heterocyclic compound.

13. The organic light-emitting device of claim 12, wherein the emission layer further comprises a host, and the host is different from the heterocyclic compound.

14. The organic light-emitting device of claim 13, wherein the emission layer emits blue light.

15. The organic light-emitting device of claim 13, further comprising an emitter that is a fluorescent emitter and/or a delayed fluorescence emitter.

16. The organic light-emitting device of claim 12, wherein the emission layer further comprises a host, and a sensitizer, wherein the host, the heterocyclic compound, and the sensitizer are different from each other.

17. The organic light-emitting device of claim 16, wherein the emission layer emits blue light.

18. The organic light-emitting device of claim 16, further comprising an emitter that is a fluorescent emitter and/or a delayed fluorescence emitter.

19. An electronic apparatus comprising the organic light-emitting device of claim 11.

20. An organic light-emitting device comprising:

a first electrode;

a second electrode; and an organic layer arranged between the first electrode and the second electrode and comprising an emission layer, wherein the emission layer comprises the heterocyclic compound of claim 1, wherein the emission layer comprises a host, and a sensitizer, and the heterocyclic compound of claim 1, wherein the host, the heterocyclic compound, and the sensitizer are different from each other, and wherein the heterocyclic compound satisfies Condition 5:

$$0\ \mu s < T_{decay}(HC) < 5\ \mu s \qquad \text{Condition 5}$$

wherein, in Condition 5, $T_{decay}(HC)$ indicates a decay time of the heterocyclic compound.

21. A heterocyclic compound represented by Formula 1-1 or 1-2, and wherein the heterocyclic compound satisfies Condition 5:

Formula 1-1

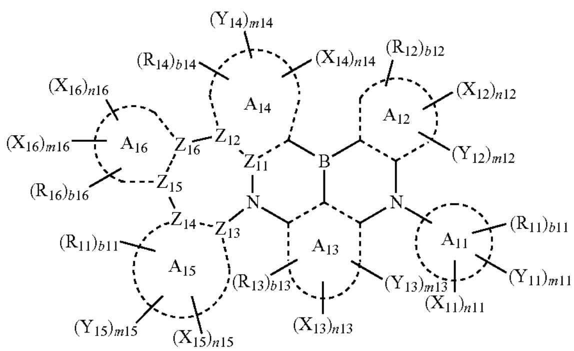

wherein, in Formulae 1-1 and 1-2, $A_{11}$ to $A_{16}$ are each independently a substituted or unsubstituted $C_5$-$C_{30}$ carbocyclic group or a substituted or unsubstituted $C_1$-$C_{30}$ heterocyclic group, $X_{11}$ to $X_{16}$ are each independently a group represented by Formula 2-1 or 2-2, n11 to n16 are each independently 0, 1, or 2, the sum of n11 to n16 in Formula 1-1 is 1 or more, and the sum of n11 to n15 in Formula 1-2 is 1 or more, $Y_{11}$ to $Y_{16}$ are each independently a substituted or unsubstituted $C_3$-$C_{10}$ cycloalkyl group, a substituted or unsubstituted $C_3$-$C_{10}$ cycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, or a substituted or unsubstituted monovalent non-aromatic condensed polycyclic group, m11 to m16 are each independently 0, 1, or 2, the combined sum of n11 to n16 and m11 to m16 in Formula 1-1 is 2 or more, and the combined sum of n11 to n15 and m11 to m15 in Formula 1-2 is 2 or more, $Z_{11}$ to $Z_{16}$ are each independently a carbon atom, and a bond between $Z_{11}$ and $Z_{12}$, a bond between $Z_{13}$ and $Z_{14}$, and a bond between $Z_{15}$ and $Z_{16}$ are each independently a single bond or a double bond, Formula 2-1

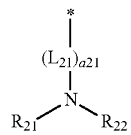

Formula 2-2

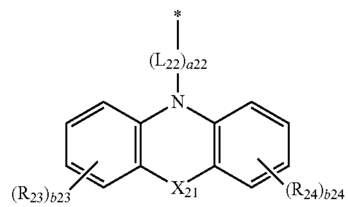

wherein, in Formulae 2-1 and 2-2, $X_{21}$ is a single bond, O, S, $N(R_{25})$, or $C(R_{25})(R_{26})$, $L_{21}$ and $L_{22}$ are each independently a substituted or unsubstituted $C_5$-$C_{30}$ carbocyclic group or a substituted or unsubstituted $C_1$-$C_{30}$ heterocyclic group, a21 and a22 are each independently 0, 1, or 2, $R_{21}$ and $R_{22}$ are each independently a substituted or unsubstituted $C_6$-$C_{60}$ aryl group, $R_{11}$ to $R_{16}$ and $R_{23}$ to $R_{26}$ are each independently hydrogen, deuterium, —F, —Cl, —Br, —I, —$SF_5$, a hydroxyl group, a cyano group, a nitro group, an amidino group, a hydrazino group, a hydrazono group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$C(Q_1)(Q_2)(Q_3)$, —$B(Q_1)(Q_2)$, —$N(Q_1)(Q_2)$, —$P(Q_1)(Q_2)$, —$C(=O)(Q_1)$, —$S(=O)(Q_1)$, —$S(=O)_2(Q_1)$, —$P(=O)(Q_1)(Q_2)$, or —$P(=S)(Q_1)(Q_2)$, b11 to b16 are each independently 0, 1, 2, or 3, b23 and b24 are each independently 0, 1, 2, 3, or 4, $Q_1$ to $Q_3$ are each independently hydrogen, deuterium, —F, —$C_1$, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, a $C_1$-$C_{60}$ alkyl group that is substituted with at least one deuterium, —F, a cyano group, a $C_1$-$C_{60}$ alkyl group, a $C_6$-$C_{60}$ aryl group, or a combination thereof, or a $C_6$-$C_{60}$ aryl group that is substituted with deuterium, —F, a cyano group, a $C_1$-$C_{60}$ alkyl group, a $C_6$-$C_{60}$ aryl group, or a combination thereof, and

* indicates a binding site to a neighboring atom, $$0\ \mu s < T_{decay}(HC) < 5\ \mu s \quad \text{Condition 5}$$

wherein, in Condition 5, $T_{decay}$(HC) indicates a decay time of the heterocyclic compound.

* * * * *